US005222030A

United States Patent [19]

Dangelo et al.

[11] Patent Number: 5,222,030

[45] Date of Patent: Jun. 22, 1993

[54] METHODOLOGY FOR DERIVING EXECUTABLE LOW-LEVEL STRUCTURAL DESCRIPTIONS AND VALID PHYSICAL IMPLEMENTATIONS OF CIRCUITS AND SYSTEMS FROM HIGH-LEVEL SEMANTIC SPECIFICATIONS AND DESCRIPTIONS THEREOF

[75] Inventors: Carlos Dangelo, San Jose; Vijay K. Nagasamy, Mountain View; Ahsan Bootehsaz, Santa Clara; Sreeranga P. Rajan, Sunnyvale, all of Calif.

[73] Assignee: LSI Logic Corporation, Milpitas, Calif.

[21] Appl. No.: 507,201

[22] Filed: Apr. 6, 1990

[51] Int. Cl.[5] .............................................. G06F 15/60

[52] U.S. Cl. .................................... 364/489; 364/488; 364/578

[58] Field of Search ............... 364/488, 489, 490, 491, 364/578

[56] References Cited

U.S. PATENT DOCUMENTS

| | | | |
|---|---|---|---|
| T940,008 | 11/1975 | Oden et al. | 364/490 |
| 4,697,241 | 9/1987 | Lavi | 364/488 |
| 4,703,435 | 10/1987 | Darringer et al. | 364/489 |
| 4,890,238 | 12/1989 | Klein et al. | 364/491 |
| 4,908,772 | 3/1990 | Chi | 364/491 |
| 4,922,432 | 5/1990 | Kobayashi et al. | 364/489 |
| 4,967,367 | 10/1990 | Piednoir | 364/489 |

OTHER PUBLICATIONS

"Automatic Generation of Digital System Schematic Diagrams" by A. Arya et al., IEEE 22nd Design Automation Conference, 1985, pp. 388-395.

"Partitioning and Placement Technique for CMOS Gate Arrays" by G. Odawara et al., IEEE-Computer-Aided Design, vol. CAD-6, No. 3, May 1987, pp. 355-363.

"Methods Used in an Automatic Logic Design Generator (ALERT)" by T. D. Friedman et al., IEEE-Computers, vol. C-18, No. 7, Jul. 1969, pp. 593-614.

"An Efficient Heuristic Procedure for Partitioning Graphs" by B. W. Kermghan et al., The Bell System Technical Journal; Feb. 1970, pp. 291-307.

*Primary Examiner*—Vincent N. Trans

*Attorney, Agent, or Firm*—Gerald E. Linden; Michael D. Rostoker

[57] ABSTRACT

A methodology for generating structural descriptions of complex digital devices from high-level descriptions and specifications is disclosed. The methodology uses a systematic technique to map and enforce consistency of the semantics imbedded in the intent of the original, high-level descriptions. The design activity is essentially a series of transformations operating upon various levels of design representations. At each level, the intended meaning (semantics) and formal software manipulations are captured to derive a more detailed level describing hardware meeting the design goals. Important features of the methodology are: capturing the users concepts, intent, specification, descriptions, constraints and trade-offs; architectural partitioning; what-if analysis at a high level; sizing estimation; timing estimation; architectural trade-off; conceptual design with implementation estimation; and timing closure. The methodology includes using estimators, based on data gathered over a number of realized designs, for partitioning and evaluating a design prior to logic synthesis. From the structural description, a physical implementation of the device is readily realized.

23 Claims, 13 Drawing Sheets

METHODOLOGY FOR DERIVING EXECUTABLE LOW-LEVEL STRUCTURAL DESCRIPTIONS AND VALID PHYSICAL IMPLEMENTATIONS OF CIRCUITS AND SYSTEMS FROM HIGH-LEVEL SEMANTIC SPECIFICATIONS AND DESCRIPTIONS THEREOF

TECHNICAL FIELD

The present invention relates to computer-aided design tools and techniques for the design and implementation of complex circuits and systems, particularly digital devices.

BACKGROUND OF THE INVENTION

Present day state-of-the-art design technique, logic synthesis, is really only a mapping between different levels of physical abstration.

One of the most difficult problems in design automation is the inability to get timing closure at even the gate level effectively. This forces designers to do two designs: logic design and timing design. Otherwise, the designer simply over-designs the circuits, because the best case timing is much different from the worst case timing. In other cases, designers insist on control of device layout so that they can evaluate all of the tradeoffs between implementation and timing.

Present computer aided design (CAD) systems for the design of electronic circuits, referred to as ECAD or Electronic CAD systems, assist in the design of electronic circuits by providing a user with a set of software tools running on a digital computer with a graphical display device. Typically, five major software program functions run on the ECAD system: a schematic editor, a logic compiler, a logic simulator, a logic verifier, and a layout program. The schematic editor program allows the user of the system to enter and/or modify a schematic diagram using the display screen, generating a net list (summary of connections between components) in the process. The logic compiler takes the net list as an input, and using a component database puts all of the information necessary for layout, verification and simulation into a schematic object file or files whose format(s) is(are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions initial conditions and input signal values provided to it either in the form of a file or user input. The layout program generates data from which a semiconductor chip (or a circuit board) may be laid out and produced.

The Modular Design Environment (MDE) produced by LSI Logic Corporation of Milipitas, Calif., is a suite of software tools for computers running the UNIX operating system. MDE comprises a schematic editor (LSED) and a simulator (LDS), among other software programs, and provides an example of commercially available tools of the aforementioned type. Another example of a schematic editor, schematic compiler, and schematic simulator may be found in the SCALDstation produced by Valid Logic Systems, Inc. of Mountain View, Calif.

VHDL, or VHSIC (Very High Speed Integrated Circuit) Hardware Description Language, is a recently developed, higher level language for describing complex devices. The form of a VHDL description is described by means of a context-free syntax together with context-dependent syntactic and semantic requirements expressed by narrative rules. VHDL is described in *IEEE Standard VHDL Language Reference Manual* (IEE Std 1076-1987), and is also known as MIL-STD-454, Regulation 64.

VHDL represents an important step forward in design specification languages because the semantics, or intent, of the language constructs are clearly specified. In theory, VHDL unambiguously describes a designer's intended system or circuit behavior, in syntactic terms. The "design entity" is the primary hardware abstraction in VHDL. It represents a portion of a hardware design that has well-defined inputs and outputs and performs a well-defined function. A design entity may represent an entire system, a sub-system, a board, a chip, a macrocell, a logic gate, or any level of abstration in between. A "configuration" can be used to describe how design entities are put together to form a complete design.

VHDL supports three distinct styles for the description of hardware architectures. The first of these is "structural" description, wherein the architecture is expressed as a hierarchical arrangement interconnected components. The second style is "data-flow" description, in which the architecture is broken down into a set of concurrent register assignments, each of which may be under the control of gating signals. This description subsumes the style of description embodied in register transfer level (RTL) descriptions. The third style is "behavioral" description, wherein the design is described in sequential program statements similar to a high-level programming language. In the main hereinafter, the behavioral description style is discussed. However, all three styles may be intermixed in a single architecture.

A methodology for deriving a lower-level, physically-implementable description, such as a RTL description of the higher level (e.g. VHDL) description, via an intermediate rule-based tool such as Prolog, is disclosed herein.

Prolog is a programming language based on predicate logic. It can be used for "intelligent" tasks like mathematical theorem proving. A Prolog program is a set of rules which define the relationships among objects. The general form of a Prolog rule is a "horn" clause, in which a specified "goal" is true if certain conditions are true. Execution of a Prolog program involves finding a proof for the goal in question, using unification and resolution. An important aspect of Prolog employed in the present invention is "term_expansion", which converts predefined rules into ordinary Prolog clauses.

DISCLOSURE OF THE INVENTION

It is therefore an object of the present invention to provide a methodology for deriving a valid structural description of a circuit or system from a behavioral description thereof, thereby allowing a designer to work at higher levels of abstraction and with larger, more complex circuits and systems.

It is a further object of the present invention to provide a technique for automatically translating behavioral descriptions of a circuit or system into physical implementations thereof.

It is further object of the invention to raise the level of design validation from a structural (net list) level to a behavioral level.

It is a further object of the invention to provide a more standardized design environment, thereby alleviating the need for cross-training between different design platforms and allowing resources to be directed more towards synthesis and testability.

According to the invention, there is provided an electronic CAD system operated with a suite of software tools for enabling a designer to create and validate a structural description and physical implementation of a circuit or system (hereinafter, "device") from a behavior-oriented description using a high-level computer language. The methodology includes the following steps:

First, the designer specifies the desired behavior of the device in a high-level language, such as VHDL. The description includes high-level timing goals.

Next, in a "behavioral simulation" step, starting with the VHDL behavioral description of a design, the designer iterates through simulation and design changes until the desired behavior is obtained.

Next, in a "partitioning" step, the design is partitioned into a number of architectural blocks. This step is effectively one of exploring the "design space" of architectural choices which can implement the design behavior. Links to the physical design system enable high level timing closure by constraining the feasible architectural choices to those which meet the high-level timing and area (size) goals. This is a key step because it represents the bridge between the conceptual level and the physical level. A second function of this step is to direct the various architectural blocks to the appropriate synthesis programs.

Next, in a "logic synthesis" step, a number of separate programs are used to efficiently synthesize the different architectural blocks identified in the partitioning step. Those blocks having highly regular structures or well understood functions are directed to specific synthesis tools (e.g. memory or function compilers). Those blocks with random or unstructured logic are directed to more general logic synthesis programs. The output of this step is a net list of the design.

Next, in a "physical simulation" step, the gate-level design description is simulated, comparing the results with those from the initial behavioral simulation. This provides a check that the circuit implementation behaves as intended, and that the timing goals are achieved.

Optionally, the design is back-annotated to ensure that other physical design limitations, such as capacitive loads and parasitics, are not exceeded.

Finally the design is input to existing software systems which control the physical implementation of the design, such as in an ASIC (Application Specific Integrated Circuit) device.

An important feature of the present invention is that, as with all top-down design approaches, the foregoing is a process of architectural refinement in which design realization moves down through levels of abstraction. The characteristics of VHDL and the disclosed methodology enable this process to occur without losing the intent and meaning present at higher levels. This is the key to automating the process.

Another important feature is that the partitioning step, or partitioner, in effect, uses high-level timing information extracted from the chip floorplan to constrain the design into the feasible architectural choices which meet the high-level timing goals. These constraints are key to allowing the process to converge to specific physical embodiments.

Another important feature is that the methodology enables timing closure without going to actual layout, solving one of the most difficult problems in design automation today, namely the inability to get timing closure at even the gate level effectively which in the past has forced designers to create two designs: a logic design and a timing design. Using the methodology disclosed herein, timing closure can be obtained by using a form of back annotation which will extract timing data from floorplanning-level layouts and then incorporate this data into the I/O (Input/Output) ports of the VHDL behavioral description.

According to an aspect of the invention, the behavioral (VHDL) description of the device is interpreted by attaching one or more semantic rules to each of the syntactic rules underlying the behavioral description. This is accomplished (such as via Prolog) using a "syntax attributed tree".

Other objects, features and advantages of the invention will become apparent in light of the following description thereof.

DETAILED DESCRIPTION OF THE INVENTION

Introductory Comments

Figure 1:
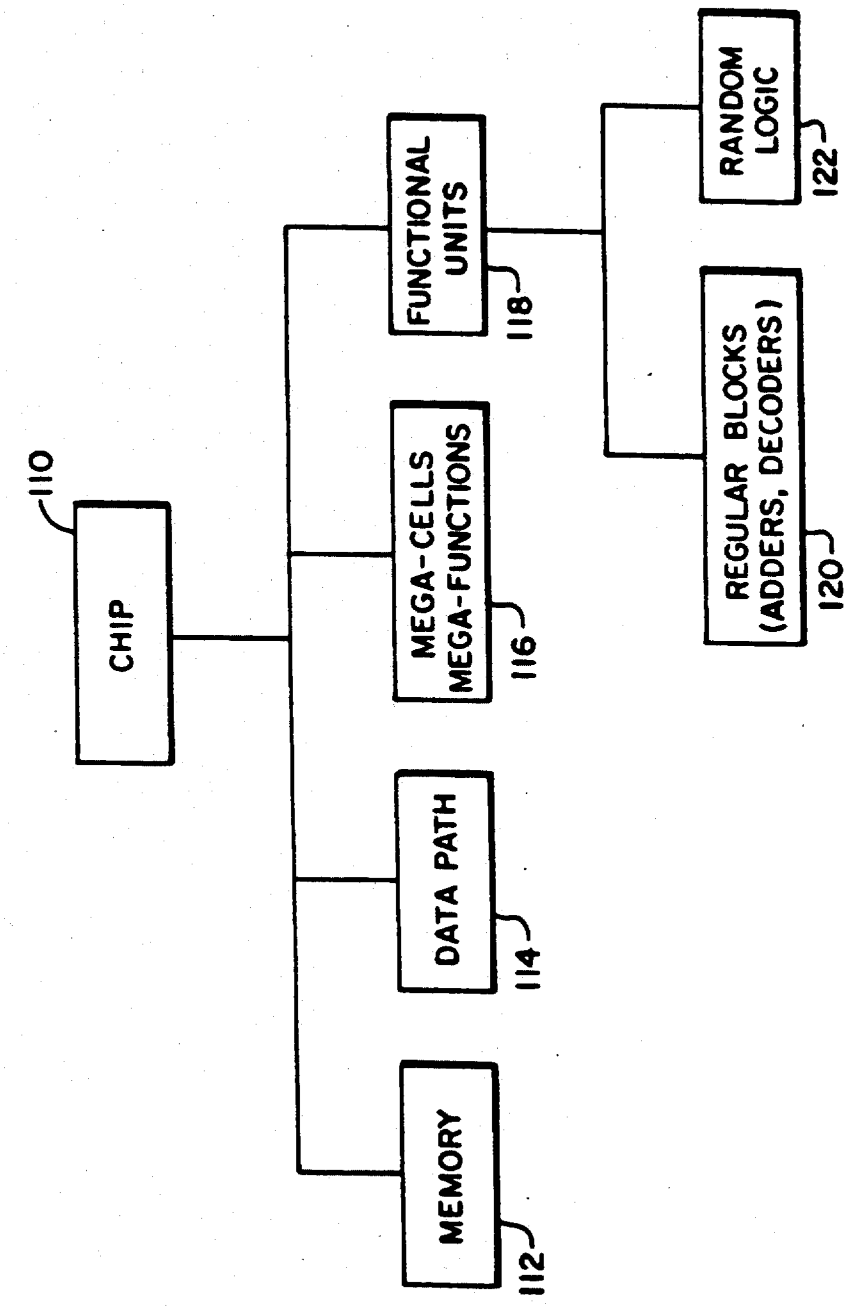
FIGS. 1-7 are schematic representations of the methodology of the present invention.

In modern digital systems, designs incorporating 70,000 logic gates or more are not uncommon. Also, in modern analog electronic systems, especially where the function being designed is intended to be incorporated into an integrated circuit, it is not uncommon to encounter designs comprising many hundreds of transistors and other electronic devices. These designs, due to their complexity, present a need for frequent simulation of the circuit being designed in small parts before it is simulated as a whole. This is necessary because errors in a small portion of the circuit are easy to detect when that small portion is simulated in isolation. On the other hand, when the entire circuit is simulated, compound errors may occur which mask other errors. Further the enormity of modern circuit complexity makes the errors in the small portion of the circuit difficult to recognize.

In the prior art, the process of designing an electronic circuit on a typical ECAD (Electronic CAD) system is done in several discrete steps. A schematic diagram of the circuit is entered interactively through the use of a schematic editor which produces a digital representation of the circuit elements and their interconnections. The user of the ECAD system then prepares a list of input stimuli (vectors) representing real input values to be applied to the simulation model of the circuit. This representation is then compiled by a schematic compiler and translated into a form which is best suited to simulation. This new, translated representation of the circuit is then operated upon by a simulator, which produces numerical outputs analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate. This process is performed iteratively until the user is satisfied that the design of the circuit is correct.

The schematic editor of the ECAD system is usually an interactive software tool which enables the user to select from a number of circuit elements which will be graphically displayed upon a graphical/text display device, hereinafter referred to as the display screen, connected to the computer. These displayed elements may then be interconnected by lines representing wires drawn on the display screen by the user through interaction with the computer via a position input device, which may be a pointing device such as a mouse, trackball, joystick, graphic tablet, or keyboard used to enter coordinates on the display screen and commands to the software tool. The circuit elements and their interconnecting wires form a schematic diagram which is viewed either in whole or in part on the display screen. As the schematic diagram is constructed on the display screen, the computer represents these elements in a storage medium, which may be a memory or a mass storage device such a magnetic disk drive. These representations, taken as a group, form a numerical representation of the schematic which has been entered by the user in a standardized form which is understood by the schematic editor. Typically, this form has been optimized for the entry and modification of schematic information.

Often, schematic editors allow fop heirarchical design whereby a previously created and stored schematic may be recalled and viewed and used as a macro-level component in other circuits. Multiple instances of such macro-level components may be included in a higher-level schematic diagram. The schematic editor creates data structures effectively replicating the macro-level component. The higher-level schematic may further be incorporated as a macro-level component into yet higher-level schematic diagrams, and so on.

FIG. 13

Figure 13:
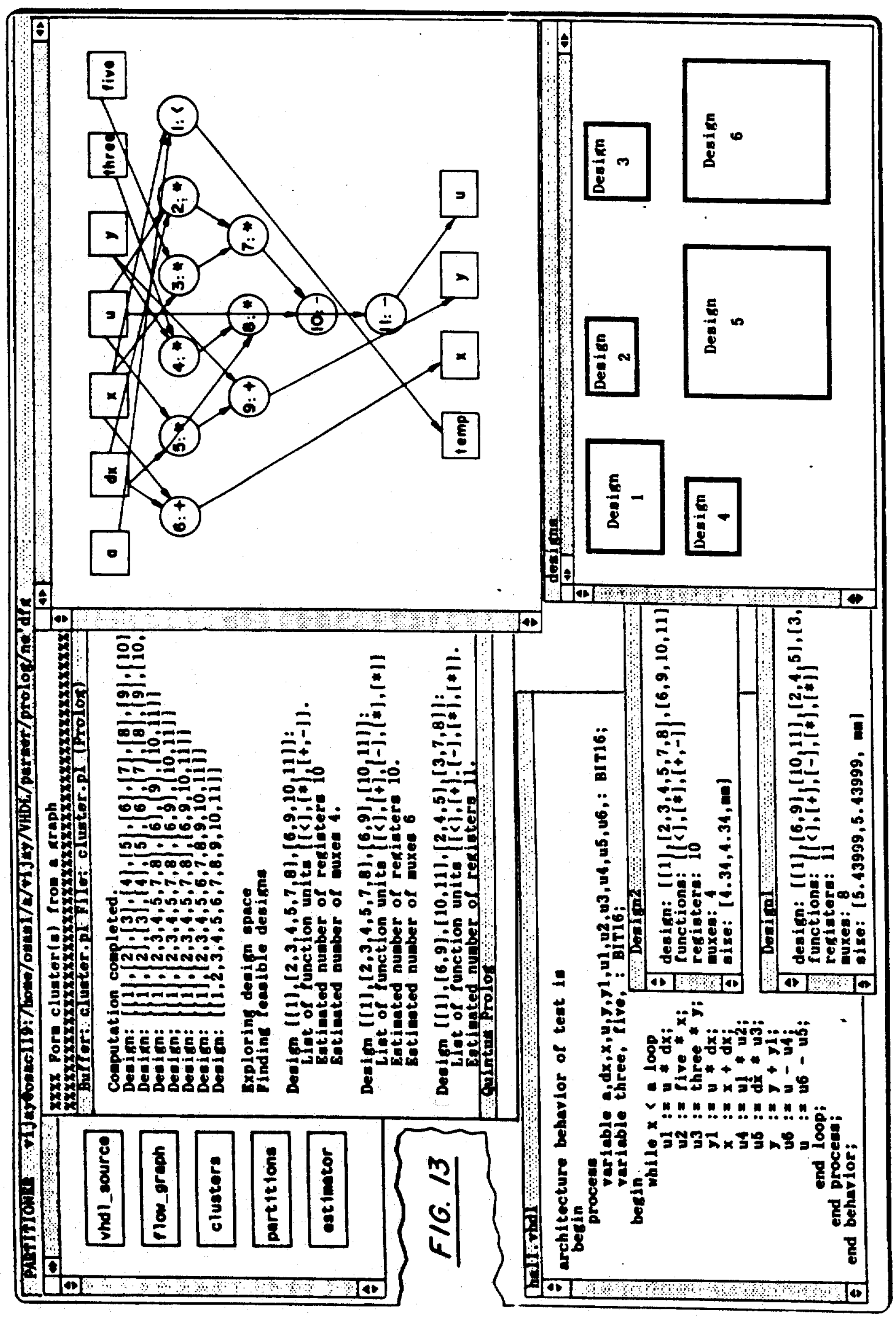
FIGS. 13-15 are exemplary screen displays generated by a computer system employing the methodology of the present invention.

FIG. 13 shows a generalized design methodology 1210. It should be understood that the descriptions contained herein are in terms of a suite of software "blocks" that can be run on any suitable computer system (not shown).

A designer begins designing a circuit (or system) by formulating a behavioral description of a circuit's desired behavior in a high-level computer language, such as VHDL. This is represented in the block 1212, which shows exemplary high-level code describing a desired behavior.

Next, the designer re-formulates the design as a register-transfer level (RTL) description of the circuit in terms of pre-designed functional blocks, such as memories and registers. This is represented in the block 1214.

The resulting RTL description is simulated, in a block 1216, to ensure that it equates to the original behavioral description. At that point, the design consists of synthesizable parts (combinational logic, registers and flip-flops) and non-synthesizable parts (pre-designed blocks).

The logic is then minimized in a block 1218, by finding common terms that can be used repeatedly, and maps the description into a specific technology (e.g., CMOS) in a block 1220. Further, the non-synthesizable parts are compiled in a block 1222.

The foregoing steps 1212 through 1222 are all technology independent (except for the step 1222, to the extent that it is technology dependent)

The design of at least the synthesizable parts is optimized in a block 1224 to produce a gate-level net list 1226.

The blocks 1218 through 1222 represent a typical logic synthesis tool.

Strictly speaking, only the steps after the RTL description is produced constitute "logic synthesis", and such a bottom-up approach (re-formulating the behavioral description into a RTL description) tends to be flattened out and/or lose much of the intent of the original behavioral description, as well as being labor-intensive and error-prone.

According to the present invention, described below, "behavioral synthesis" will bridge the gap between a behavioral description and a RTL description to produce a valid gate-level net list automatically from a high-level behavioral description. In a sense, behavioral (e.g., VHDL) and RTL circuit descriptions can both be considered "high-level" descriptions, since they do not deal with gate-level representations. The distinction between a behavioral description and a RTL description is primarily in the amount of structure that they specify and in the "allocation" or definition of structural components that will be used in the resulting gate-level implementations. Behavioral descriptions do not address the issue of what specific structural components (e.g. memory, functional blocks, etc.) are to be used. In an RTL description, structural components are explicitly identified and there is a direct mapping between this description and the resulting gate-level implementation.

The ability to synthesize behavioral and RTL descriptions is significantly impacted by this difference in structural content. RTL synthesis ("low-level" synthesis) is a relatively well-studied, and much implemented, technology. The ability to synthesize an RTL description into a gate-level implementation is well established.

The present invention discloses a methodology for mapping a behavioral description with little or no structural content into a RTL level description with significant structural content. This is largely, but not entirely, a top-down design methodology.

What is lacking in a strictly top-down design methodology is the use of detailed knowledge of lower level physical information of the modules (circuits, functional blocks, etc.) being designed. Typically, the decisions concerning the selection and placement of modules are deferred until the time the bahavioral synthesis is complete and an RTL structure has been chosen for the implementation. The reason for this is that, typically, structural information is not available at the behavioral level, and hence the system is unable to employ criteria such as area and delays while exploring the design space. Details such as layout, module size and interconnect can have an enormous effect on the shape of the RTL design space.

As will become evident hereinafter, partitioning the design at a high level (behavioral description) into architectural blocks creates a "vehicle" for providing such structural information at the behavioral description level, thereby adding the ability to estimate lower-level physical parameters. Further, partitioning helps the designer explore other avenues such as operator level parallelism and process level concurrency in order to improve the design.

FIGS. 1-8

There follows an exemplary embodiment of the invention described in the context of an ASIC design.

FIG. 1

FIG. 1 is a simplistic view of an ASIC chip 110, covering gate arrays and standard cells, in the context of synthesis. In general, an ASIC chip consists or all or some of the different functional entities shown in the Figure. Moreover, the Figure describes means for synthesis/compilation and optimization of these blocks. Not shown in the Figure are the chip's I/O buffers and periphery. Although synthesis tools are not meant to manipulate I/O buffers, nevertheless their timing description in the optimization environment can be beneficial for optimization of the chip's core part.

The exemplary chip 110 includes the following major functional blocks: memory 112, data path 114, mega-cells and mega-functions 116 and functional units 118 which may include regular blocks 120 such as adders and decoders and random logic 122.

The memory block 112 is generated by memory compilers using efficient technology-dependent building blocks. The output of the memory compiler is a net list of primitive transistors.

The data path block 114 is generated by providing the behavioral description in an HDL (Hardware Definition Language) language. The data paths can be synthesized through general purpose synthesis programs or specialized data path compilers. The output of the synthesis programs/compilers is the structural description of the design using ASIC macro-cells.

The mega-cell and mega-function block 116 is chosen from pre-designed building block libraries, which are already designed for optimal performance.

The regular functional units 120 are generated using regular blocks such as adders, decoders and multiplexers. These blocks can be further optimized, if desired.

The random logic blocks 122 includes random logic, glue logic and the state controller. The description of these units is provided in Boolean equations, truth table, data flow and HDL description. This part of the chip is designed around the other parts. This functional unit is partitioned into smaller chunks of functional units, and the process is recursively repeated. The atomic features are still functional units that are readily functionally verifiable. A general purpose synthesis/optimization tool is used to create these functional units, and to optimize the units according to the specified constraints and those imposed by memory, regular blocks and data path sections.

FIGS. 2-5

FIGS. 2-5 describe a synthesis design methodology that is independent of any particular design style or technology. The various steps (blocks) of this methodology are represented by the circled numerals 1-18, and are as follows:

Step 1 is Design Specification. This consists of system (device) specification and may include functional specifications of subsystem elements, timing specifications and I/O requirements, and power, package and interface requirements.

Step 2 is Design Description. This is the functional description of the design and all its subsystem elements. The description is, ideally, given in a high level description language, such as VHDL. Depending on the nature of the design, the description can be entirely at the behavioral level, or it may be intertwined with an RTL description.

Figure 14:
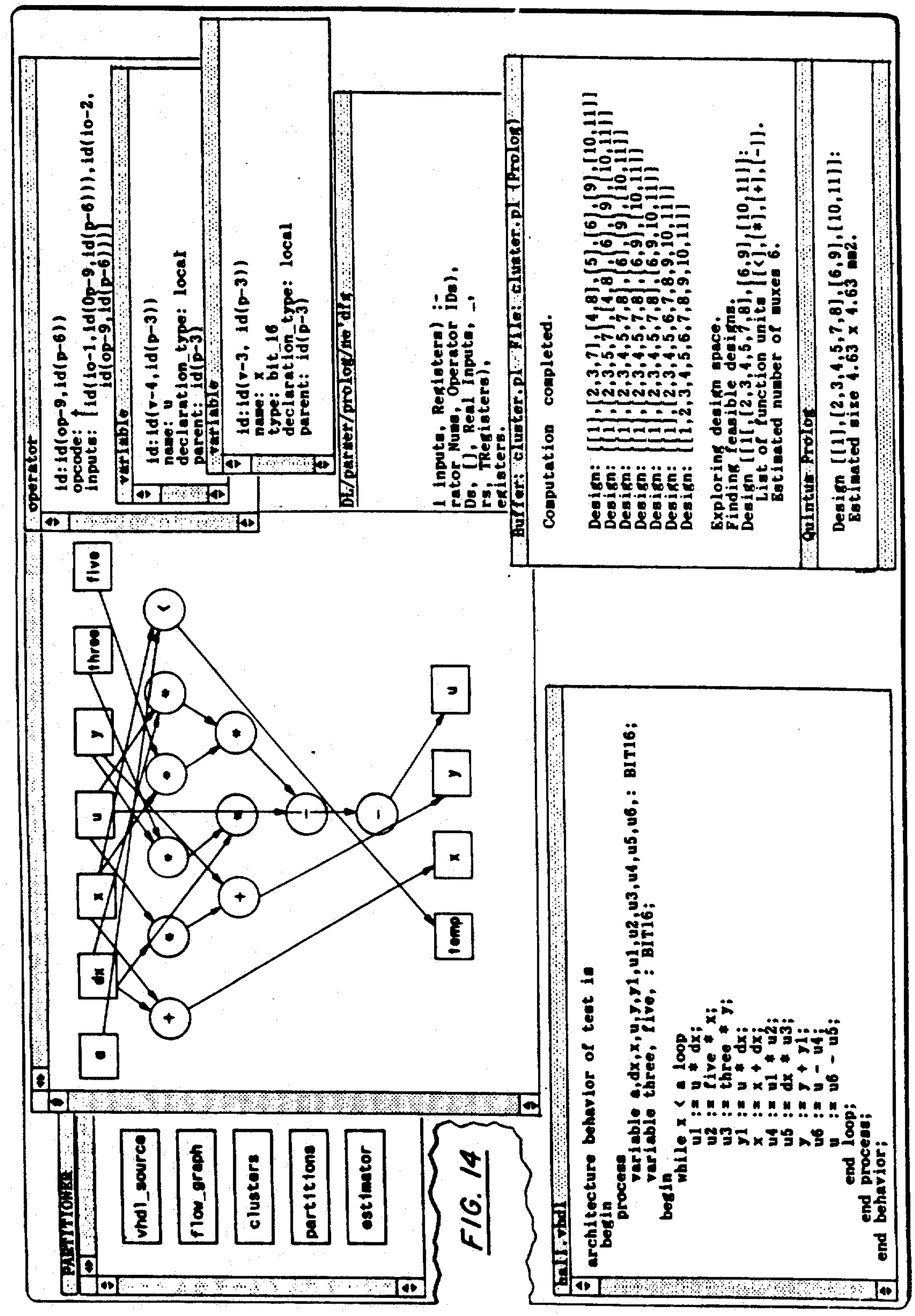
Figure 15:
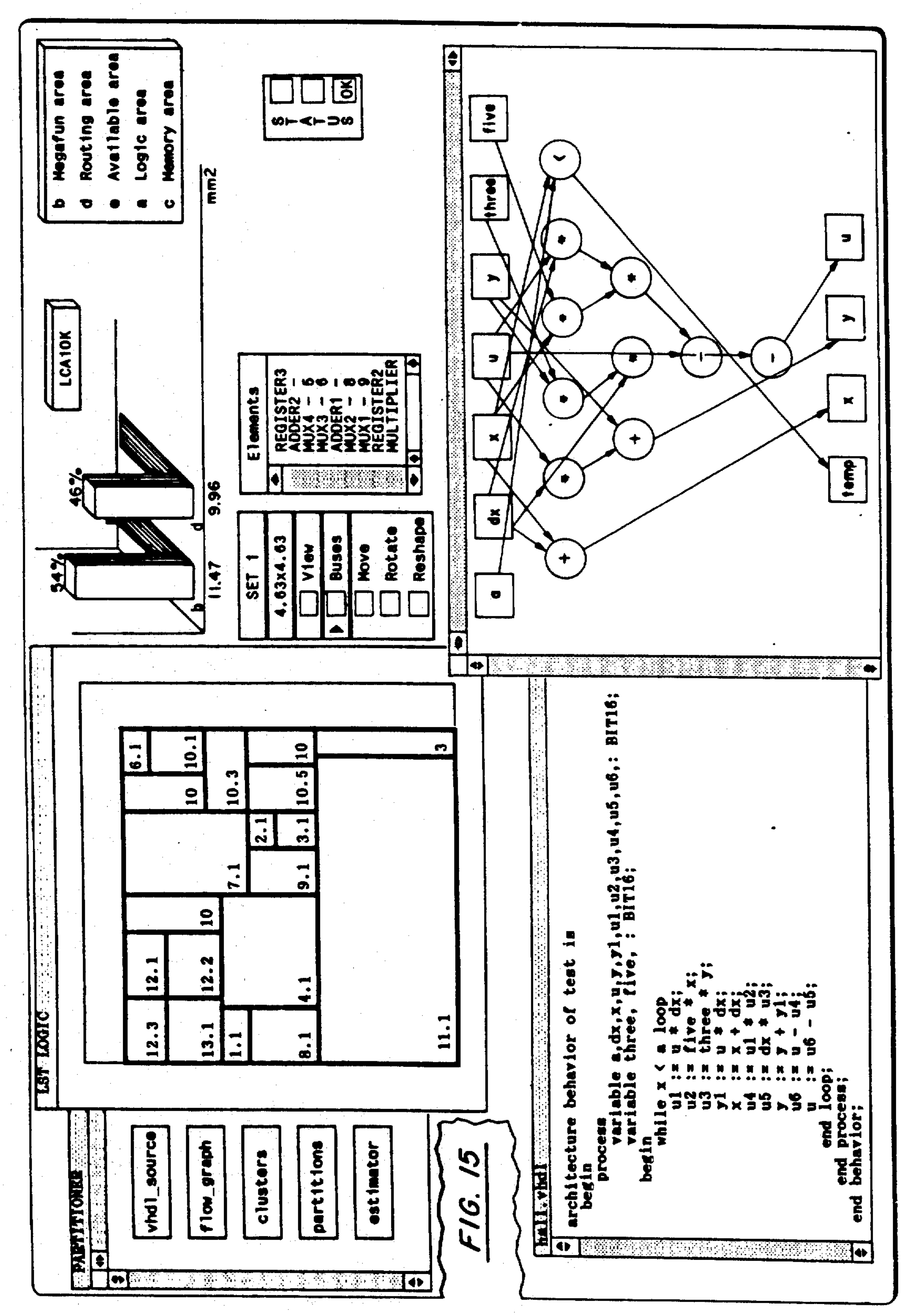

Step 3 is Partitioning. Given the behavioral description of the design, partitioning (the Partitioner) breaks the design into separate modules that will make the overall synthesis, analysis and verification tasks more manageable. In doing so, the Partitioner consults technology files described hereinafter) containing packaging, I/O capabilities and other technology-dependent information to optimally partition the design. In addition to functionally partitioning the design, the Partitioner can help the designer (see FIGS. 13-15 showing representative screen displays of the CAE system) in choosing the optimal architecture that would optimize the design, e.g. in terms of area and speed.

Step 4 is Module Description. Three modules are shown, but there could be many more modules involved. This is the RTL description of the partitioned design, in terms of an HDL (hardware definition language) description. Each module is accompanied with a set of timing and area constraints, which are related only to that module's domain (they are not automatically derived from the design description).

Step 5 is Composition. Composition is the opposite of partitioning, and facilitates examination and verification of the partitioned design. The partitioned design is reconstructed in this step, the end product of which is an RTL description of the entire design.

Step 6 is Functional Verification (Behavioral). Verification at the behavioral level is performed at two stages—while the design is being developed, and after the partitioning step. The former is source code debugging where the high level description of the design is verified for correctness of the intended functionality. The latter is to verify the architectural decisions that were made during partitioning, and to examine their impact on the functionality and performance of the entire design.

Figure 2:
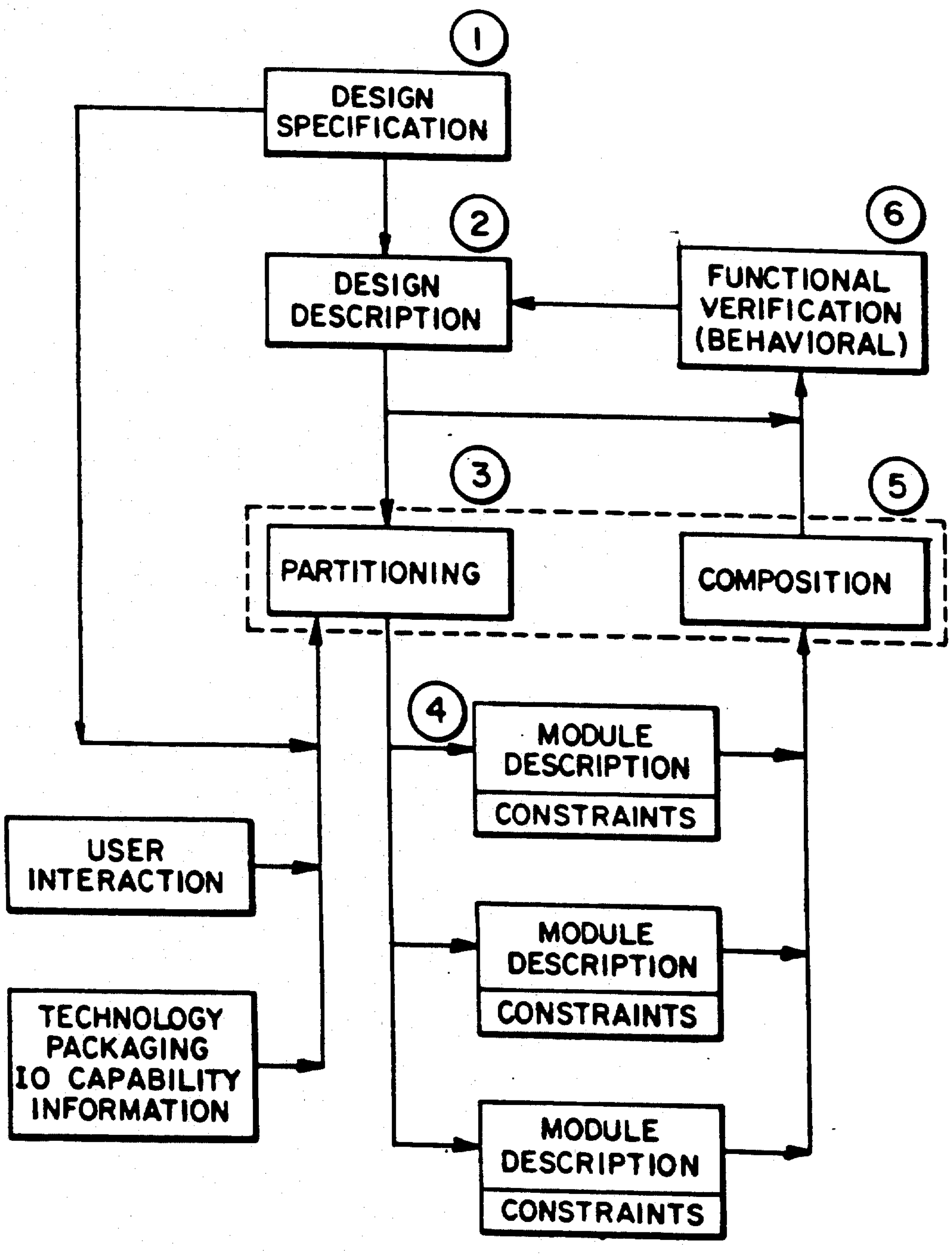
Figure 4:
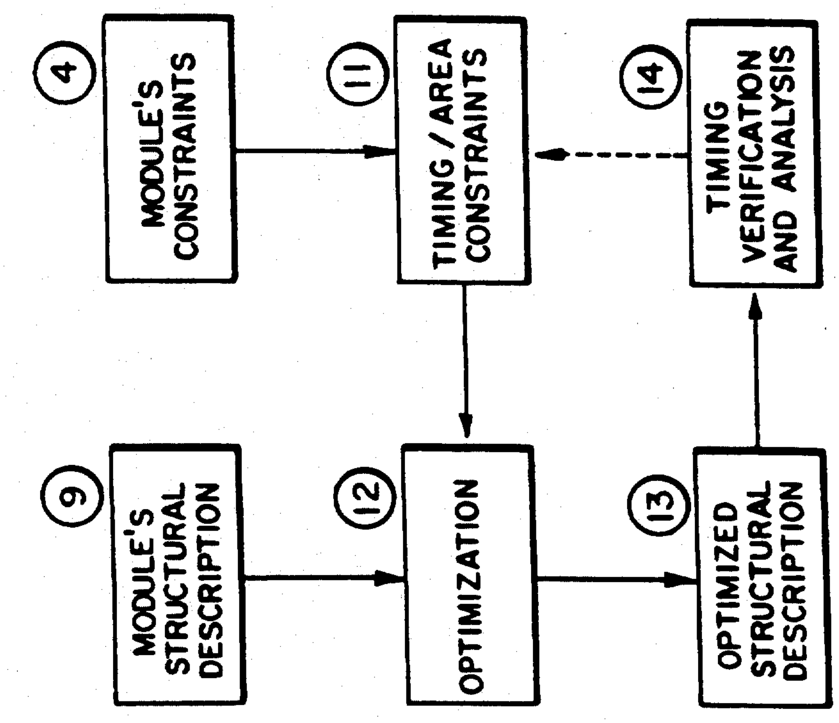
Figure 3:
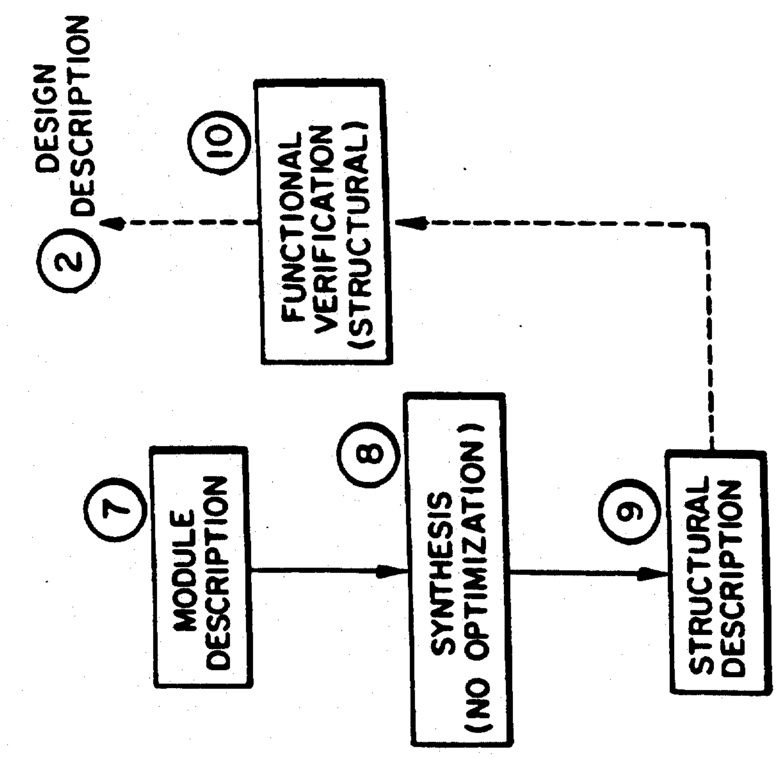
Figure 5:
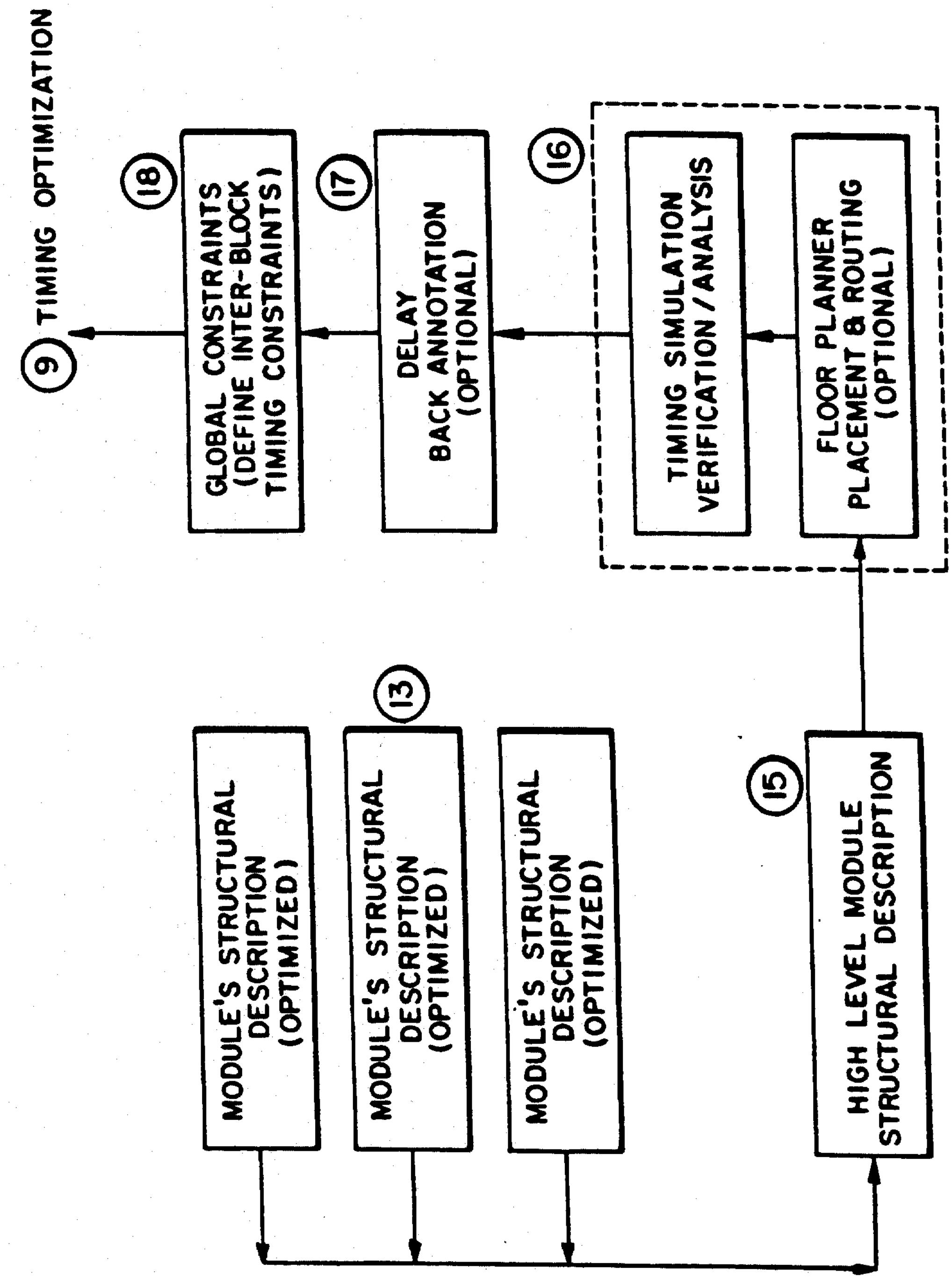

It will be noticed, in the above description of the steps shown in FIG. 2, that various "loops" are formed. A high level loop consists of behavioral verification (step 6) to debug the design description (step 2). A lower level loop consists of behavioral verification (step 6) of the partitioned (step 3) and composed (step 5) design. The partitioning process is guided by user interaction, and is driven by physical implementation factors such as technology, packaging, I/O capability and other information about the proposed device which is developed based on experience with similar devices.

Step 7 is Module Description. This is the description of a functional entity that is produced by the Partitioner or developed independently by the designer. This is preferably given in one of the following formats: HDL, truth table, equations or net list. As used in this example, a "module" is a functional block with a complexity of less than 3000 cells (it is not a chip with I/O pads).

Step 8 is Synthesis. Given the module description (step 7) and a target technology library, the design is mapped into the target technology. The synthesis process usually includes some form of logic optimization. This is the task of manipulating the logic expressions that define the functionality of the module (device). Minimization is done by removing redundancies, and adding or removing intermediate levels of logic (e.g., restructuring of Boolean expressions).

Step 9 is Structural Description. This is the gate-level, technology-dependent description of the module produced by the synthesis tool. It is usually given in the form of a net list, from which a device can be automatically physically created.

Step 10 is Functional Verification (Structural). This is done to verify the correctness of the module against the intended functionality. This is only required if functional verification at the behavioral level (step 6) has not been performed. One assumes that the circuit generated by the synthesis tool complies (functionally) with the given module description. In case of discrepancies, the module description needs to be modified (debugged) at the top level, i.e. Design Description (step 2). This is necessary in order to preserve the integrity of the design and all of its subsystem elements.

Step 11 deals with Timing/Area Constraints. These are used to customize the optimization process. Optimization is usually driven by area and speed (timing) constraints. These might instruct the tool to perform rudimentary area versus speed trade off on individual or small clusters of gates, or to perform comprehensive area and speed optimizations in combination with other constraints such as drive capability. A rich set of constraint constructs is required for meaningful design optimization, and are provided in the methodology of this invention. Timing constraints may include the following: maximum and minimum rise/fall delay, set-up and hold check, length of clock cycle and maximum transition time per net. The timing constraints may also include boundary conditions, such as signal skew at the module's inputs, drive capabilities of the modules outputs, etc., when such data is available.

Step 12 is Optimization. Given the design constraints and the module's structural description, the optimization process tries to modify the module so that its area and timing characteristics comply with the specified constraints. Depending on the nature of the design and the strength of the constraints, some or all optimization goals will be achieved. When no boundary conditions are available, optimization may be general purpose, aimed at minimization of the overall module. With boundary conditions, the objective is to optimize each module so that the overall higher level module complies with the specified timing requirements.

Step (block) 13 represents generating the Structural Description of the module after the optimization process.

Step 14 is Timing Verification and Analysis. This is a process of examining the effects of the optimization process (step 12), and examining its global impact. Tools such as static timing analyzers and gate level simulators would be employed. If the optimized module (step 13) does not meet all of the timing and area requirements, further trade-offs have to be made at this point. The constraints are then modified to reflect these trade-offs, and the optimization process (step 12) is repeated.

Step 15 represents a high level module, derived from the module's optimized Structural Description (step 13). A high level module consists of one or more sub-modules. Each sub-module has been optimized in its own domain. The high level module describes the interaction and connectivity between the sub-modules. When hierarchically applied, the target device itself is considered to be a high level module.

Step 16 is Timing Stimulation, Verification and Analysis. At this state, the optimized modules are composed (see Step 5) together and implement the intended functionality of the high level module, or target device. Here, analysis includes logic level simulation, static timing analysis, electrical rule checking, etc. For more accurate analysis, it might be necessary to use a floor-planner or placement and routing programs to estimate wire delays. The wire delays are then back annotated into the design database prior to simulation. If the overall timing characteristics of the modules do not meet the specified requirement, a the timing constraints of the sub-modules are modified and optimization is performed.

Step 17 is Delay Back Annotation (DBA), which is optional. The inter-block wire delays can be more accurately estimated only after floor-planning of the sub-modules. More accurate intra-block and inter-block delays are determined after the placement and routing stage. Using these tools, the wire delays can be estimated more accurately. The delays can be back annotated to be used by the gate level Optimizer (step 12).

Step 18 represents introducing Global Constraints. Using the results of the analysis performed, the sub-modules' timing/area constraints are modified to reflect the global timing requirements. Sub-modules with new constraints are then re-optimized.

FIG. 6

Figure 6:
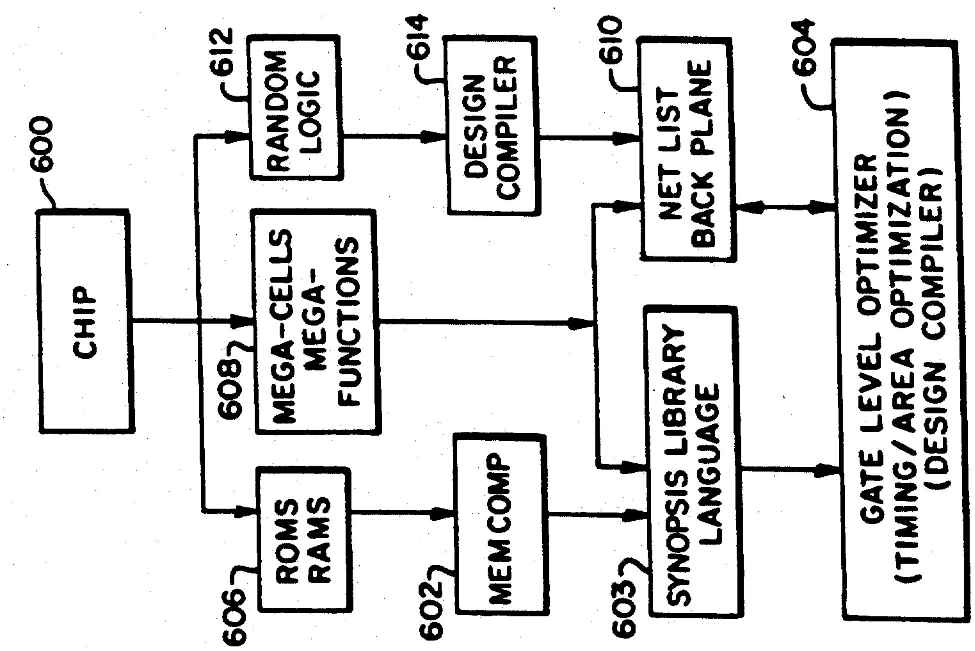

FIG. 6 illustrates the usage of exemplary synthesis and optimization tools, and the abstraction level for the exchange of design data between these tools and a Design Compiler. Each tool addresses the synthesis or compilation of one or more of the major functional blocks of an exemplary ASIC chip 600. The usage of these tools and their interaction with the Design Compiler are of particular interest.

A Memory Compiler (MemComp) 602 takes the high level specification for memory mega-cells and produces logic and layout files for the purpose of simulation, testing and layout. The objective is to provide the Design Compiler (Optimizer) 604 with an accurate timing description of and drive capability information for the memory block. MemComp synthesizes high density or los power RAM or ROM blocks 606. As will become evident, the surrounding logic is optimized with respect to the memory block. The memory block created by MemComp 602 is provided in the same format as the internal macro-cells, i.e. a net list of primitive transistors, which cannot be read directly by the Design Compiler 604. Therefore, one of two possible intermediate steps is required: 1) (not shown) the data sheet generated by MemComp is used to manually extract the timing description of the memory block. This basically involves defining a set of "set_load", "set_drive" and "set_arrival" constraints and associating them with the relevant pins of the surrounding logic at the start of the optimization process; or 2) a Memory Modeller (see FIG. 8) is used to generate a model 603 in Synopsys Library Language (SLL); available from LSI Logic Corporation). The Memory Modeller reads the memory description and generates a complete timing description of the memory block. This contains all of the setup and hold values and the timing arcs and I/O pin characteristics. This task is similar to that of the Synthesis Library Model (SLM; available from LSI Logic Corporation) generator.

Mega-cells and mega-functions 608 are treated as basic building blocks, similar to the macro-cells in the synthesis library. Both are generally developed beforehand for optimal performance, so no optimization is required on these blocks. They are presented to the Design Compiler 604 simply to provide timing information so that the surrounding blocks can be optimized. The mega-cells are modeled in the same manner as the macro-cells, i.e. by using the Synopsis (SLL) library format. The mega-functions are ported into the Design Compiler in Synopsys DataBase (SDB) format. (The netlist back plane 610 is used as the primary design representation medium). Generally, the mega-functions model industry-standard functions, thereby providing the designer with a set of popular and proven standard building blocks. In the case of certain, highly-specialized, user-defined mega-functions, it would be necessary to ensure appropriate capability in the Design Compiler.

Random logic 612, in other words the remaining modules that were not synthesized using the previously described tools and libraries, are synthesized by a general purpose logic synthesis tool 614 that optimizes the design for speed and area. It accepts hierarchical combinational and sequential design descriptions in equation, truth table, net list and/or VHDL formats. The optimization process is directed by specifying the "goals". Goals are represented as timing constraints. The optimization process makes trade-off evaluations and produces the best possible gate level implementation of the design for the specified constraints.

Since the Design Compiler 604 provides an environment for synthesis and constraint-driven optimization, it can be used as the overall synthesizer/optimizer. Blocks created by other tools can be loaded into the Design Compiler, where the timing information from these blocks can be used to synthesize and optimize the surrounding logic. For example, knowing the drive capabilities and the skews of the memory blocks' outputs would allow for accurate optimization of the glue logic.

Figure 8:
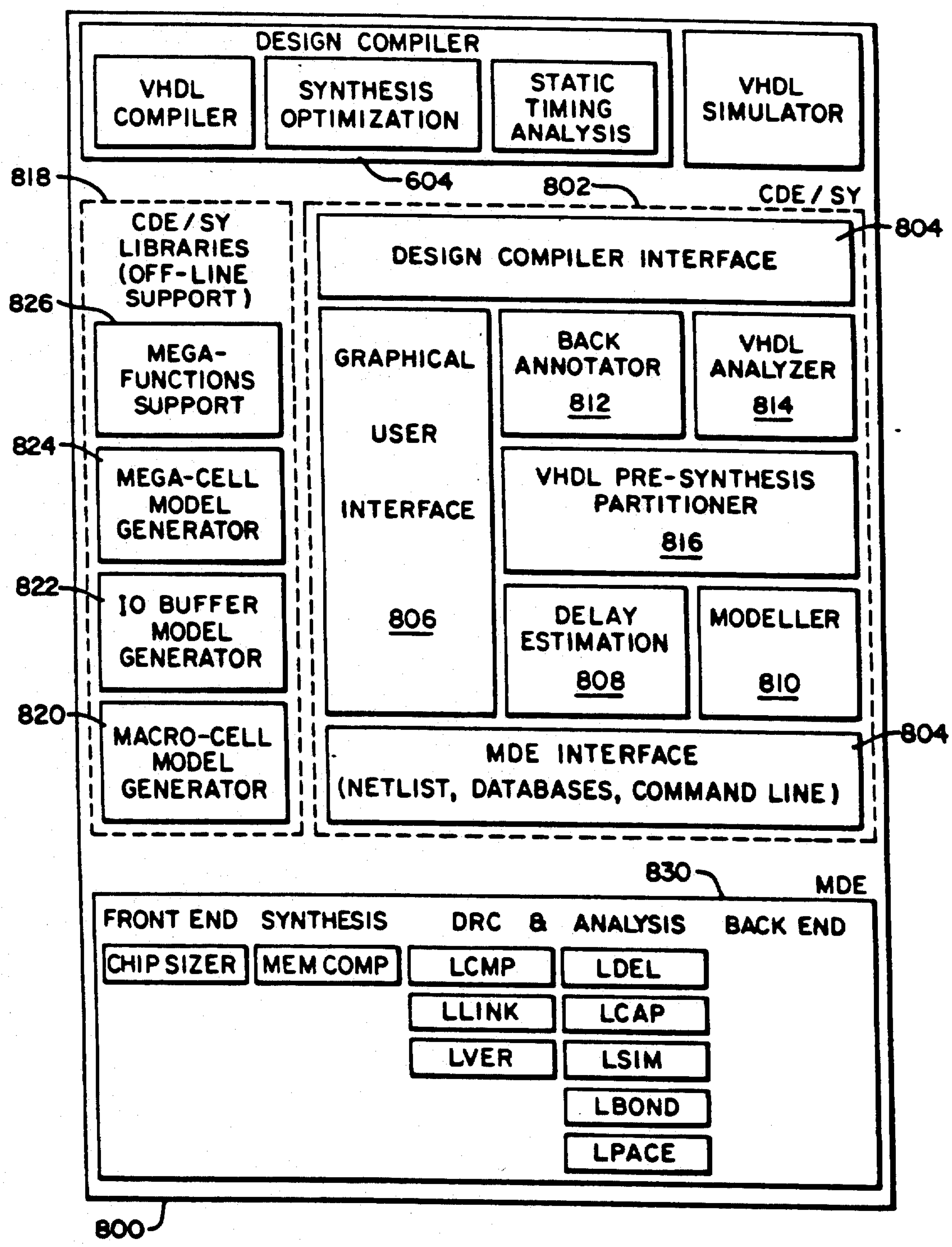
FIG. 8 is a block diagram of a suite of exemplary software tools for implementing the methodology disclosed in FIGS. 1-7.

Once the memory blocks are synthesized, and the appropriate mega-cells and mega-functions are chosen, the remainder of the design can be synthesized by the Design Compiler. Optimization is then performed according to user-defined timing constraints (see User Interface; FIG. 8) and those dictated by existing blocks. This is an iterative process. Constraints need to be refined until the desired timing and area requirements are achieved.

FIG. 7

Figure 7:
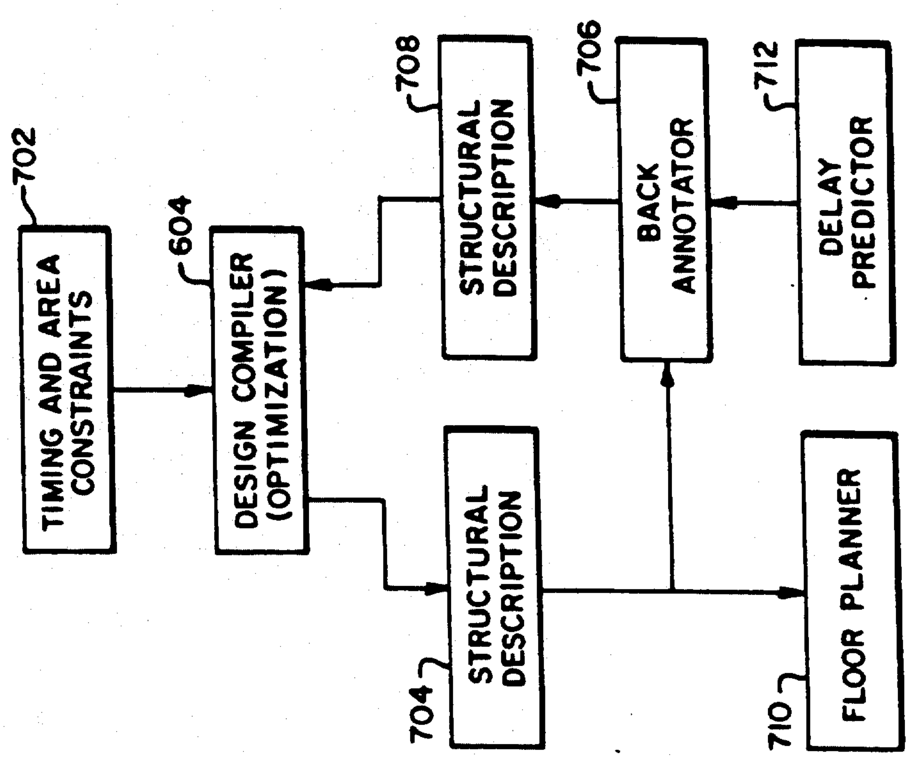

FIG. 7 shows a synthesis design framework. The objectives of the disclosed framework are: to provide a unified front end for a set of synthesis and optimization tools; to provide an integrated synthesis environment by incorporating specialized synthesis tools with the Design Compiler, which is the main synthesis and optimization tool; to provide the capability of constraints-driven gate-level optimization of both sequential and combinational designs; to provide back annotation of wire delays from the Modular Design Environment (MDE; available from LSI Logic Corporation, described hereinafter) to the Design Compiler to make the necessary timing/area trade-off evaluations based on more accurate wiring delays; to provide a window-based graphical interface between the synthesis tools and the MDE module to control the data flow between the Design Compiler, the other synthesis tools and the MDE; to provide VHDL debugging, and analysis capability to front-end synthesis from VHDL; and to provide VHDL pre-synthesis partitioning capability to front-end synthesis form VHDL.

Generally, the design framework illustrated in FIG. 7 follows from the design methodology described hereinbefore. The methodology includes the following important steps:

partitioning the design into memory blocks, mega-functions, mega-cells and random logic;

using a layout tool, such as LSI's ChipSizer (see FIG. 8), to obtain the required die size, which is a function of the area, the number of pins and pads and other factors;

choosing the mega-cells and mega-functions to be used, and characterizing the cells for the Design Compiler;

generating memory blocks, and characterizing them for the Design Compiler;

partitioning the random logic into smaller functional units;

using the Design Compiler to synthesize the remaining blocks, in a "bottom-up" manner, starting with the lower level functional units, including: verifying the functionality of the block using functional verification tools or simulators; optimizing the design for area or, in general terms, for timing of some or all of the selected paths; composing the higher level functional blocks and, when a functional block interfaces with an existing building block (e.g. memory, mega-cells, mega-functions), optimizing the functional unit (and all or some of its lower level units) according to the timing/area constraints 702 imposed by the building block; and repeating these steps until all of the functional units are synthesized into a structural description 704. The resulting structural description 704 may be back annotated 706 as a structural description 708 (of timing/area constraints) to the Design Compiler. In the loop shown:

for larger functional blocks, a floor planner 710 is used for placements and more accurate wire delay prediction 712 and, with this information, using the more accurate block size provided by the floor planner to re-estimate the internal wire delays of the lower level functional units and back-annotating these delays into the Design Compiler to provide more meaningful internal timing optimization, and/or using the wire delays of the inter-block buses and wires to derive the appropriate boundary constraints for timing optimization, i.e. to specify inter-block delays through constraint constructs; and incorporating the timing delays and drive capabilities of I/O buffers into the timing constraints. (The I/O buffers should be selected as early in the design cycle as possible.)

FIG. 8

FIG. 8 provides an overview of the design framework, illustrating an exemplary suite of tools, many of which are commercially available (as individual units), for implementing the methodology of the present invention. Herein it is important to note that the methodology of the present invention augments many discrete software tools, such as those described herein, and provides enormously increased functionality in the context of behavioral synthesis, which otherwise would not be available by simply combining these tools.

The design framework, hereinafter termed the Co-Design Environment (CDE) 800 is divided into two sections: on-line design tools and off-line design tools. The on-line design tools are programs that are utilized directly or indirectly by the user during the design process, and are relatively generalized to handle a variety of design objectives. The off-line design tools are programs that generate libraries and models of the various building blocks for the Design Compiler, and may be very user-specific.

A first group 802 of on-line tools, labeled "CDE/SY", constitutes the dynamic part of the Co-Design Environment and includes the following:

A Design Compiler Interface 804 (shown in two parts) controls the data flow and interactions between the MDE and the Design Compiler 604. It enables the user to follow the process of the design from one environment to the other, and interacts with the MDE programs via script shells and a command line. Interactions with the Design Compiler are achieved through the dc-shell script and constraints files.

A Graphical User Interface (Graphical UI) 806 facilitates user interaction with the CDE by: abstracting out those steps of the design flow that do not require the designer's intervention, assisting and guiding the designer through the various stages of the design process as outlined by the synthesis framework, and assisting the designer in the composition of the constraints file for optimization.

A Block Level Delay Estimator 808 provides the optimization tool with pessimistic wire delays which, in turn, causes the optimizer to compensate by placing buffers in and around the block or to use high power gates all over the design, and is especially applicable to small functional blocks. An advantage of using the Block Level Delay Estimator is that in pre-place and pre-layout stages of the design, both the synthesis and the analysis tools consider the wire delays to be a function of fan-out only. Although this might be a good estimate for the purposes of analysis, it has some undesirable side effects on the optimization process. Usually, in the present methodology, optimization is performed on a functional block of less than a few thousand gates, but most existing wire delay algorithms (based on fan-out) are geared towards much larger, die-sized blocks. Hence the Block Level Delay Estimator provides more realistic estimates of wire delays for the block size being manipulated through the system, and provides appropriate tables (wire_loading) to be used by the Design Compiler.

A Memory Modeller 810 reads the net list of a memory block created by MemComp (See 602, FIG. 6), and generates a timing model (in SLL) to be used by the Design Compiler. The objective is to provide the Design Compiler with accurate timing information about the memory block. This will help the optimization process as the drive capabilities, the capacitive loads, and the setup and hold time of the memory I/O will automatically define some of the constraints for the surrounding logic.

A Delay Back Annotator (DBA) 812 comes into play after the floor planning stage, and provides more accurate wire delays into the optimization database. The DBA is used for two distinct purposes: 1) to back annotate wire delays for a block that is going to be re-optimized, using the latest (and most valid) delay values); and 2) to back annotate wire delays for a block that has been optimized and has met the design constraints, thereby providing the latest delay values for accurate modeling of the block so that surrounding blocks can better be optimized.

A VHDL Analyzer 814 provides source code (VHDL) debugging and assists in functional verification of the VHDL description. The VHDL Analyzer is discussed in greater detail in FIGS. 10 and 11, and in the annexed code listing.

A VHDL Pre-Synthesis Partitioner 816 partitions behavioral descriptions (VHDL code) into RTL descriptions of modules and sub-modules. During partitioning, appropriate architectural decisions are based on time/area analysis.

The off-line part of the CDE is a collection of libraries 818, which are either in SLL (Synopsis Library Language) or SDB (Synopsys Data Base) format. SLL is a dedicated language for modelling of cells or modules, and is most suitable for synthesis and timing (static) analysis. SDB (available from LSI Logic corporation) is the Design Compiler's database, and can contain a design description in a multitude of formats, including Boolean expressions, truth tables and net lists.

A Macro-Cell Model Generator 820 reads the structural description of the macro-cells from the MDE libraries and generates the appropriate models in SLL. The behavior of sequential cells may be modeled by the Model Generator, subsequently to be manipulated by the Design Compiler.

An I/O Buffer Model Generator 822 provides timing and drive capability information on the I/O buffers, which are modeled as ordinary macro-cells in the CDE environment. Data derived therefrom is used for optimization of the logic inside the chip. The Optimizer (Design Compiler 604) is not expected to manipulate the I/O buffers. This Model Generator is capable of handling configurable buffers, which are modelled as "n" cells, where "n" is the number of all the possible configurations of that buffer.

A Mega-Cell Model Generator 824 is similar to the Memory Modeler in the on-line portion of the CDE in that the objectives are generally the same. However, as mega-cells are static and do not change from one design to the other, this modelling can be performed in advance to create a synthesis mega-cell library.

Mega-Functions Support 826 provide the Design Compiler with timing information about the mega-functions. This helps the optimization process, since the drive capabilities, capacitive loads, and path delays of the mega-functions will define some constraints for the surrounding logic. Mega-functions are essentially "black boxes" from the user's point of view. Therefore, the Design Compiler is configured to prevent users from viewing or altering the mega-functions.

The various functions of the Design Compiler are shown in the block 604, and a VHDL Simulator (for behavioral and structural verification, discussed hereinbefore) is shown at 828.

Illustrative tools (ChipSizer, MemComp, LCMP, LLINK, LVER, LDEL, LCAP, LSIM, LBOND and LPACE), commercially available within LSI Logic's Modular Design Environment 830 are shown. Generally, these tools consist of a set of programs that compile, link, simulate and verify digital logic at the chip (structural) level. Any number of other, commercially available programs could be employed at this level to perform similar functions.

FIGS. 9

Figure 9:
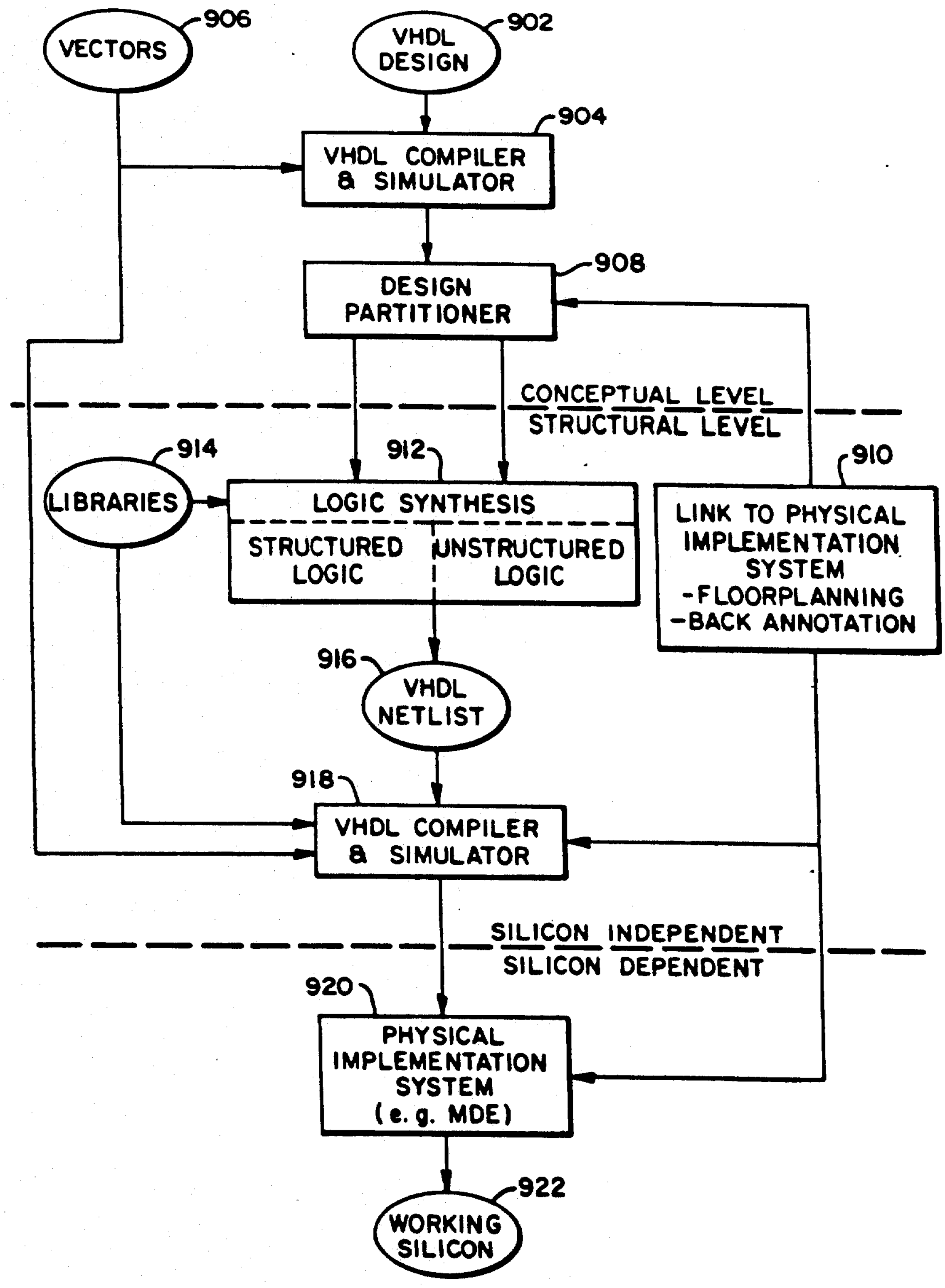
FIG. 9 is a block diagram of the methodology of the present invention.

FIG. 9 shows a more generalized arrangement of the methodology of the present invention, in such terms that one skilled in the art to which the invention most nearly pertains could readily implement the methodology.

At the conceptual level, a behavioral description 902 of the target device is formulated in a high-level language, such as VHDL. The behavioral description is compiled and simulated 904 using test vectors 906 to verify the design description. The behaviorally-verified design is partitioned 908 into suitable architectural blocks, as described above. Partitioning allows for the critical link 910 to the physical implementation of the target device, incorporating critical size (area) constraints (i.e. floor planning) and critical timing (speed) information (i.e back annotation).

At the structural level, the partitioned design is provided to logic synthesis tools 912 which formulate both structured and unstructured logic (functional blocks). Additional information regarding the functional blocks is derived from libraries 914. Importantly, the timing-/area constraints introduced through the partitioner 908 are embedded at the logic synthesis stage. The output of the logic synthesizer 912 is a net list 916 for the target device, such as in VHDL, which is compiled and re-simulated 918 (904), using the test vectors 906 and pre-defined information about blocks contained in the libraries 914. If necessary, updated timing/area constraints are provided back through the partitioner 908 and the target device is re-synthesized 912 to meet the desired goals. By iteratively repeating this process, both the behavioral and structural descriptions of the target device can be fine tuned to meet and/or modify the design criteria.

At both the conceptual (behavioral) and structural levels, the design of the target device is technology (silicon) independent.

After a valid, verified net list has been described, the structural description of the target device is provided to a suitable silicon compiler (Physical Implementation System) 920, such as LSI Logic's MDE, to create a working device 922. At this stage, the tools required are technology (silicon) dependent.

FIGS. 10-11

Figure 10:
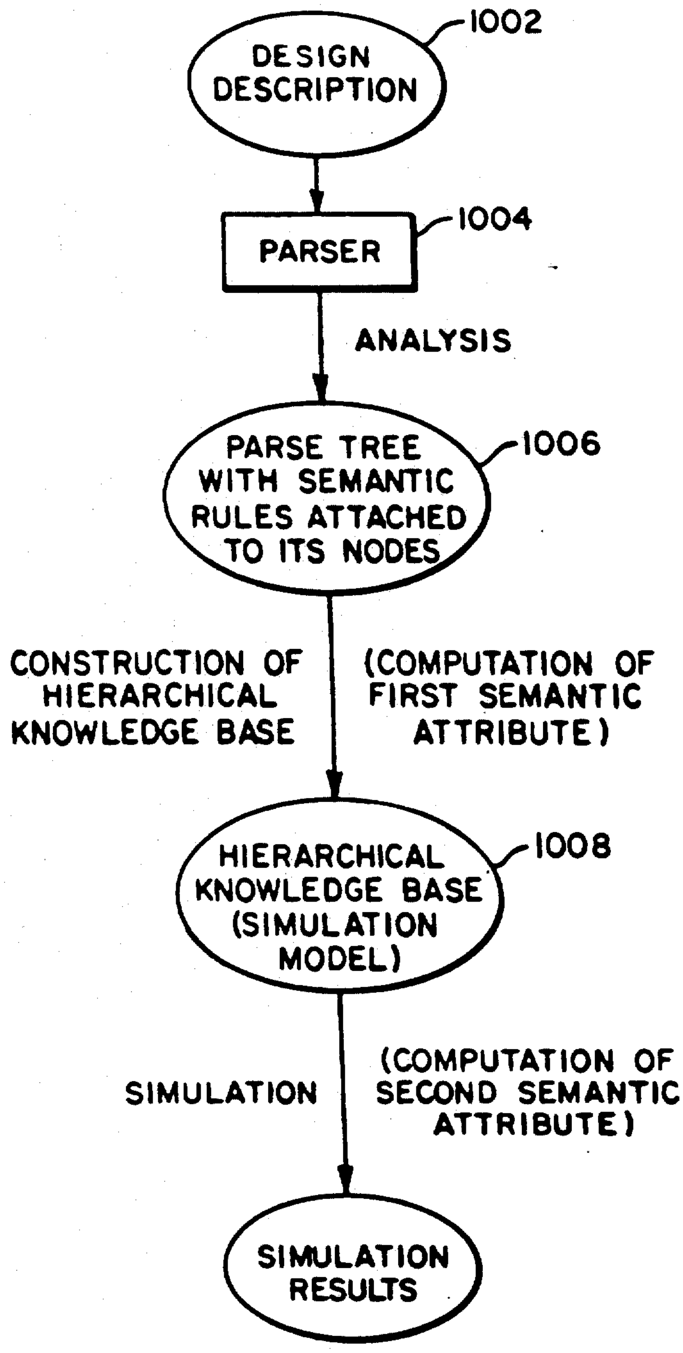
FIG. 10 is a block diagram of the Analyzer portion of the present invention.
Figure 11:
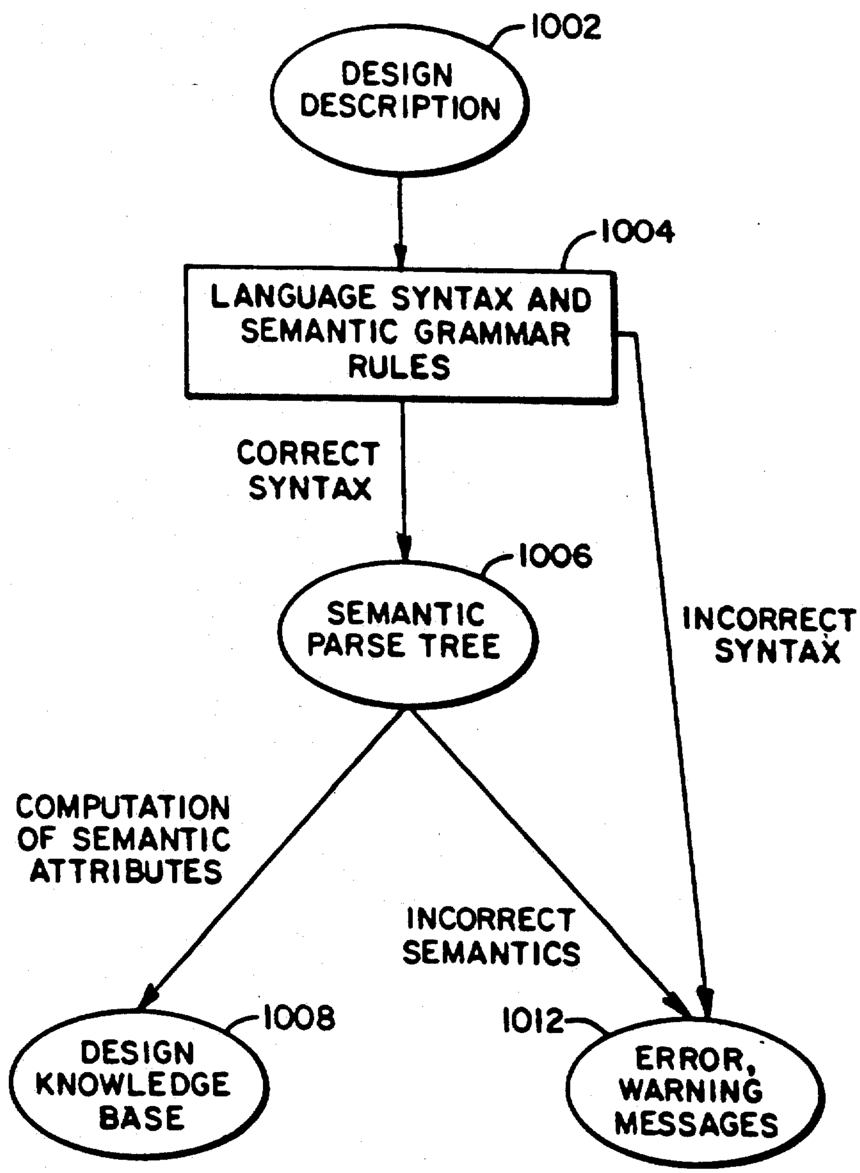
FIG. 11 is a block diagram showing the Analyzer.
Figure 12:
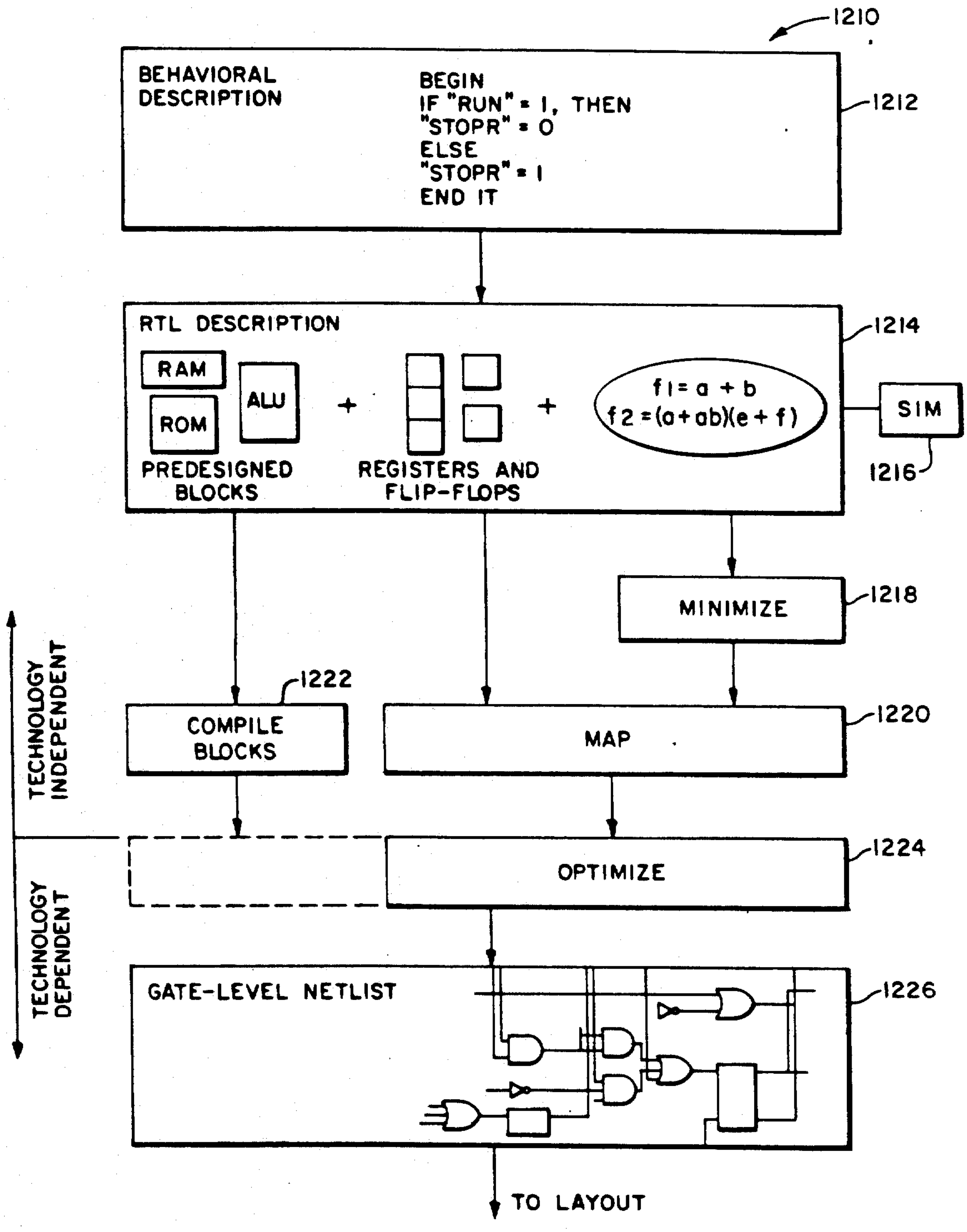
FIG. 12 is a block diagram of a generalized logic synthesis methodology, lacking critical features of the present invention.

FIGS. 10 and 11 illustrate a hierarchical knowledge base approach to simulate hardware descriptions in a high-level Hardware Description Language (HDL). In this approach, a knowledge base is constructed corresponding to each functional block of the hardware description. The hierarchical relationships among the various blocks in the description is mapped on to the knowledge base corresponding to those blocks. The hierarchical knowledge base thus formed is used for simulating the hardware description. Unlike previous approaches to simulation and verification of digital circuits (devices) described in a HDL, there is no need for intermediate translation steps.

In the past, artificial intelligence techniques have been used in formal verification and hybrid simulation of digital hardware to address the problem of combinatorial explosion of exhaustive logic simulation. In one approach, structural and behavioral descriptions of a design are first translated into first order clauses in Prolog. This set of clauses asserted in a Prolog data base can be viewed as a "flat" knowledge base. The hierarchy in the design is enforced implicitly by suitable relationships among the assertions in the knowledge base. A theorem prover is then used to establish the equivalence between the structural specification and the behavioral description to formally verify the design as represented by the data base. This approach has the disadvantages of translating a HDL description of a design into first order clauses and maintaining a large knowledge base which is difficult to manage for complex, hierarchical systems. In another approach, hybrid simulation is used to verify digital designs. the design is described as an interconnection of functional modules in a first order language, such as Prolog. The design may be hierarchical with the lowest level being Boolean gates. It is then simulated with both numerical and symbolic input signal values. This, again, has the drawback of having to maintain a large Prolog description for complex hierarchical designs.

The present methodology differs from the previous approaches by not having to go through intermediate translation steps, and not having to maintain a Prolog description of the design. Generally there are three steps in the present methodology:

Analysis, wherein the input description is analyzed for syntactic and semantic correctness, and a parse tree is formed. Each node in the parse tree is associated with a semantic rule.

Construction of the hierarchical knowledge base, wherein the semantic rules associated with nodes of the parse tree are used to construct a knowledge base for each block of the description, and the hierarchical relationships among the knowledge bases are derived from the semantic rules. The knowledge bases contain simple assertions and methods to compute functions and procedures present in the source description. The also make up the basis for other design tools.

Simulation, wherein using these simple assertions and computation methods contained in the knowledge bases, the output signal values are calculated for a given set of input signal values. The input stimulus can be either symbolic expressions or numerical values.

FIG. 10 shows the steps in simulating a design description.

Beginning with a design description 1002 written in a formal, high-level language, the description is analyzed (parsed) 1004 using, for instance, definite clause translation grammars (DCTG) to form a parse tree 1006. In the parse tree, semantic rules are attached to each node. Each syntactic rule for the formal (high-level) language is associated with one or more semantic rules. Preferably, two semantic rules are associated with each syntactic rule—one of the semantic rules is used to verify the semantic description of the description, and the other semantic rule is used to simulate the description. Each rule has a semantic and a syntactic part. The semantic part has two attributes, namely, "check_semantics" and "execute". The semantic rules specify how these attributes are computed and verified. Using this technique, it is not necessary to go through intermediate translation steps to analyze and execute a description. Rather, the methods of analysis and execution are specified in conjunction with the syntactic rules of the language.

After a successful parse of the given description, each node in the parse tree thus formed is associated with the attributes as specified in the DCTG rules of the language. The computation of an attribute attached to a node can be a recursive transversal of sub-trees associated with the node. For semantic analysis, one semantic attribute verifies whether any semantics of the language is violated, and error messages (see FIG. 11; 1012) would be generated. These violations include redefinition of objects within the same scope and incorrect argument types to a procedure. Only a correct description is passed on to the hierarchical knowledge base 1008. Thus the analysis of the description ensures that it conforms to the syntax and semantics of the HDL description, and leads to the construction of a valid hierarchical knowledge base.

The hierarchy in a design description can be of two kinds. One is imposed by the structural design description in which a design entity (component, process, function, architecture, configuration) is composed of several other design entities. The second relates to scoping and visibility rules of the language. The knowledge base 1008 is formed, i.e. one knowledge base for each design entity, after the syntax and semantic analysis of the input HDL description. Each knowledge base has a set of unit clauses which correspond to all the static declarations, default values of signals, variables and the data structures necessary for simulation corresponding to the design entity. The hierarchical relationships among the knowledge bases are automatically derived while analyzing the design description using the DCTG rules of the HDL. this corresponds to a direct mapping of the hierarchy in the hardware design description. The need for a hierarchical knowledge base also arises due to the scope and visibility rules of a formal language that is being analyzed. The scoping and visibility rules are also used to determine the relationships among the design entity knowledge bases. The hierarchical knowledge base 1008 makes up a simulable model of the design. Other design tools such as synthesis and partitioning tools (discussed hereinbefore) also use the knowledge bases for extracting design information.

In the past, because of the scope and visibility of the rules of a formal language, in both translation and compilation, every identifier is given a unique names. However, in the case of simulation, when the description is being executed directly, this technique is not feasible.

The description contained in the knowledge base may contain different levels of abstraction of hardware design, namely, behavioral, RTL and gate level descriptions. Simulation involves execution of all the functions, procedures and processes for generating transactions on the drivers. A driver is associated with every signal that appears in a signal assignment statement and is represented by a sequence of transactions (each transaction is a value/time pair). Generating transactions, ordering them according to certain constraints, and scheduling them at a certain time is the key to simulation. The input test vectors for simulation are asserted in the knowledge base corresponding to the design entity in which the input signal appears. The test vectors can be either symbolic expressions or numerical values. The DCTG rules are again applied to the simulation data structures stored in the knowledge bases, and a second semantic attribute ("execute") is computed. this set of semantic rules constitutes the simulation engine. It includes computation of values o arithmetic expressions, Boolean expressions, symbolic expressions, time expressions, execution of sequential and concurrent statements, and generation of transactions. the computation is ordered by the simulation semantics of the language in conjunction with the hierarchical relationships. After generating transactions for all drivers, they are ordered with regard to time, synchronicity and simultaneity. As simulation time advances, the drivers update the values of the associated signals. This causes events to occur on the signals which may cause certain processes to "wake up" and in turn lead to the occurrence of more events. The next step is to schedule the events on the signals. This is handled by a scheduler which looks at the event ordering and generates unit clauses related to the time, signal and value of a scheduled event. The final step is to assign the value to the signal at the appropriate time.

It may happen that there could be multiple drivers due to multiple signal assignments in the source description. For the same signal, multiple drivers might try to assign values at the same time. In such a case, the value is resolved by a resolution function associated with the signal, and the resolved value is assigned to the signal. This leads to unit clauses which give the final resolved values of every signal present in the design description, in the simulation results 1010.

FIG. 11 is an overview of the types of rules, described above, for defining the correct relationship between objects in the constructed knowledge bases, for converging to correct structural representations of behaviorally-specified designs, and for enforcing a "good" style of VHDL code leading to the correct structural representations.

Prolog provides a useful tool for implementing the described methodology. Prolog grammars such as DCTG are useful in associating semantic rules with syntactic rules of the hardware description language (e.g. VHDL), and the inference engine contained in Prolog makes it straightforward to handle derivation of the inter-relationships between the different entities in the knowledge base.

The hierarchical knowledge base, described above, helps maintain the hierarchical nature of large hardware designs and permits large hardware descriptions to be directly simulated without having to go through intermediate translation steps. The knowledge base can be used by other tools, such as those set forth above.

An executable listing of the Analyzer/Interpreter, as described with respect to FIGS. 10 and 11, is appended hereto.

FIGS. 13–15

FIGS. 13 through 15 show representative screen displays of the methodology of the present invention, as they would be presented to the user. In the main, the display of FIG. 13 is discussed In the lower left "window" of the display of FIG. 13 is shown a VHDL description of a counter ("while x<a loop . . . "), created by the user. The user then simulates the code, at the high-level, to ensure that it the description is correct, by providing operands ("variables").

The system then creates "data flow", relating to the sequencing of operations and the parallel or serial configuration of functional blocks required to realize the counter, and presents the results to the user in graphical and/or textual form. In this example, seven design alternatives are displayed in the upper left window ("Design: [[1]. . . "). One of these design alternatives, selected by the user for viewing, is displayed in the upper right window (as interconnected circle and square primitives) In the lower right window is displayed the estimated area that would be required to implement the design, and is technology dependent. Also displayed in the upper left window are estimates of functional units (registers, muxes) that would be consumed by the various design alternatives. This all relates to exploring the design space, and allows the user to perform a "what if" analysis for choosing a preferred design in terms of size, speed, performance, technology and power. (In the upper left window of FIG. 15 are shown size estimates for particular functional blocks labelled "8.1", "11.1", etc.) All of the above is performed prior to any synthesis, to allow the user to make intelligent trade-offs leading to a viable design, by interacting at the architectural level.

By partitioning, accurate timing estimates can be derived as discussed hereinbefore (not shown in the screen displays).

SUMMARY

A methodology is described for the implementation of complex digital systems. The methodology includes:

a) a mechanism for semantic capture of the specification and description of the digital hardware for which an implementation is desired;

b) hardware descriptions embodied in a specification language, such as VHDL (or VHDL Intermediate Format), having well standardized semantics;

c) utilization of an appropriate software language, such as Extended Definite Clause Grammar (EDCG) and Prolog, for formal capture of the semantics of b);

d) direct execution of the semantics and of the behavior of the hardware described in a) and b);

e) execution of the intent contained in the description of a) without a translation step, such as with Prolog and its predicate logic formalism (knowledge representation of the digital hardware is achieved via the imbedding provided by predicate logic, semantic description of EDCG, Prolog and the VHDL language);

f) system level partitioning for creating optimized versions of hardware functional blocks for trade-off display, predicting for estimating hardware resources (sizes), speed and power, and mapping from one level of design representation to another;

g) isomorphism among various levels of partitioned hardware (across semantics, structure, behavior, logic and functions);

h) synthesis of hardware directly from semantics and intent contained in a) through f) into low level structural logic descriptions;

i) methodology for closure between the timing goals of a) through g); and j) methods for displaying knowledge in a), d), e) and f).

One skilled in the art to which the present invention most nearly pertains will readily be able to implement the invention based on the description set forth above. The above-described embodiment is set forth in terms of exemplary, well known logic synthesis tools, especially for deriving the structural representation and physical implementation from the RTL description of the device being designed. Other implementations would largely be driven by the particular technologies and logic synthesis tools that may be employed.

Appended hereto are code listings of the Partitioner program (441 pages), the Synthesis Controller program ("SYN CONTROLR") which is a background program that processes the functional calls from the VHDL description of blocks (see FIG. 6) to memory blocks, mega-cells, mega-functions and other arithmetic unit functions in MDE and replaces these blocks by a component that can be simulated and merged (443 pages), and the "LIVE" (LSI Intelligent VHDL Environment) program, which is the Analyzer referred to hereinbefore (178 pages). These are all in executable code converted into hex through a standard UNIX utility.

```
FILE: SYN     CONTROLR A1  * * * L S I   L O G I C   C O R P,   M I L P I T A S

0000000  8103 010b 0003 a000 0000 c000 0000 3744 0004 28d0 0000 2020 0000 0003 0000 0000 bc10 2000 d003 a040 9203 a044 952a 2002
0000060  9402 a004 9402 400a 1700 00f0 d422 e2e1 0300 0008 c200 6200 8090 0001 0280 0004 0100 0000 4000 0009 0100 0000 4000 2542
0000140  9c23 a020 4000 e802 0100 0000 4000 e803 0100 0000 9de3 bf68 2f00 0008 ae15 e220 1100 0008 9012 2204 4000 004b 9210 2000
0000220  ac10 0008 9203 a05c 4000 004b 9410 2020 80a2 2020 1280 004f 0100 0000 c213 a05e 80a0 610b 1280 004b 0100 0000 e803 a060
0000300  c203 a064 e203 a068 a405 0001 9204 8011 2f00 0008 ae15 e240 9010 2000 9410 2005 1720 0000 9612 e002 9810 0016 4000 0034
0000360  9a10 2000 a610 0008 9002 0014 d203 a064 9410 2007 1720 0000 9612 e012 9810 0016 4000 002b 9a10 0014 2f00 0008 ae15 e26c
0000440  1100 0008 9012 2213 4000 0023 9210 2000 aa10 0008 c203 a068 8090 0001 0280 000b 2f00 0008 ae15 e240 9004 c012 9210 0011
0000520  9410 2007 1720 0000 9612 e012 9810 0015 4000 0017 9a10 2000 c203 a070 a004 c001 e623 a07c ea23 a080 ec23 a084 0300 0008
0000600  c200 6200 c223 a098 0300 00f0 c200 62e6 c223 a08c 0300 0008 8210 605c c223 a090 9010 2001 9fc4 0000 9210 207c 81c7 e008
0000660  81e8 0000 1080 0006 8210 2005 1080 0004 8210 2047 1080 0002 8210 2003 91d0 2000 0a80 0004 0100 0000 81c3 e008 0100 0000
0000740  9010 2002 9205 e004 d405 c000 8210 2004 91d0 2000 9010 207f 8210 2001 91d0 2000 0003 c000 2f75 7372 2f6c 6962 2f6c 642e
0001020  736f 002f 6465 762f 7a65 726f 0000 0000 0000 0019 6372 7430 3a20 6e6f 202f 7573 722f 6c69 622f 6c64 2e73 6f0a 0000 0000
0001100  0000 0026 6372 7430 3a20 2f75 7372 2f6c 6962 2f6c 642e 736f 206d 6170 7069 6e67 2066 6169 6c75 7265 0a00 0000 0000 0014
0001160  6372 7430 3a20 6e6f 202f 6465 762f 7a65 726f 0a00 0000 0000 033f ffff 8200 63a0 9de3 8001 f22f a04b d006 2004 d202 2014
0001240  8090 0009 0280 000a 0100 0000 9010 0018 4000 e775 0100 0000 8090 0008 1280 0004 0100 0000 1080 0043 0100 0000 d006 2004
0001320  d202 2008 d402 6010 d606 2004 d802 e008 da03 200c 60a3 400a 0a80 0014 0100 0000 de06 2004 e003 e008 e204 2024 c204 6014
0001400  e406 2004 e604 a008 e804 e024 ea55 2010 ac10 0015 ee06 2004 d005 e008 9002 0016 d24f a04b 920a 60ff 9fc0 4000 0100 0000
0001460  1080 000d 0100 0000 f206 2004 f406 6008 f606 a00c b606 e001 f626 a00c b826 e001 d04f a04b 912a 2018 913a 2018 d02f 0000
0001540  900a 20ff 80a2 3fff 1280 000e 0100 0000 d006 2004 d202 200c 9212 6003 d222 200c d406 2004 d602 a010 9612 e003 d622 a010
0001620  d806 2004 da03 2010 9a13 6003 da23 2010 de06 2004 e003 e01c 8090 0010 0280 0008 0100 0000 9010 0018 4000 e736 0100 0000
0001700  a210 2000 1080 0003 0100 0000 a210 2000 9010 0018 1080 0003 0100 0000 9010 2000 b010 0008 81c7 e008 81e8 0000 033f ffff
0001760  8200 6398 9de3 8001 f227 a048 8090 0018 1280 0009 0100 0000 9010 2024 4000 e724 0100 0000 b010 0008 8090 0008 0280 0076
0002040  0100 0000 9010 2100 4000 e71d 0100 0000 d027 bffc d007 a048 4000 247d 0100 0000 d026 2010 d007 a048 1300 00f0 9212 63d0
0002120  4000 e716 0100 0000 d026 0000 8090 0008 1280 000c 0100 0000 9010 23ea 9210 2053 1500 00f0 9412 a3d2 d606 2010 4000 2591
0002200  0100 0000 9010 0018 1080 005f 0100 0000 d007 bffc 1300 00f0 9212 63f0 d407 a048 4000 e705 0100 0000 d007 bffc 4000 2460
0002260  0100 0000 d026 2014 d006 2014 1300 00f0 9212 63f7 4000 e6f9 0100 0000 d026 2004 8090 0008 1280 000c 0100 0000 9010 23eb
0002340  9210 2053 1500 00f0 9412 a3f9 d606 2014 4000 2574 0100 0000 9010 0018 1080 0042 0100 0000 d007 bffc 1300 00f1 9212 6023
0002420  d407 a048 4000 e6e8 0100 0000 d007 bffc 4000 2443 0100 0000 d026 2018 d006 2018 1300 00f1 9212 602a 4000 e6dc 0100 0000
0002500  d026 2008 8090 0008 1280 000c 0100 0000 9010 23eb 9210 2053 1500 00f1 9412 a02c d606 2018 4000 2557 0100 0000 9010 0018
0002560  1080 0025 0100 0000 d007 bffc 1300 00f1 9212 605a d407 a048 4000 e6cb 0100 0000 d007 bffc 4000 2426 0100 0000 d026 201c
0002640  d006 201c 1300 00f1 9212 6061 4000 e6bf 0100 0000 d026 200c 8090 0008 1280 000c 0100 0000 9010 23eb 9210 2053 1500 00f1
0002720  9412 a063 d606 201c 4000 253a 0100 0000 9010 0018 1080 0008 0100 0000 9010 2001 d026 2020 9010 0018 1080 0003 0100 0000
0003000  9010 2000 b010 0008 81c7 e008 81e8 0000 033f ffff 8200 63c0 9de3 8001 d006 0000 8090 0008 0280 000a 0100 0000 d206 2004
0003060  8090 0009 0280 0006 0100 0000 d406 2008 8090 000a 1280 0005 0100 0000 9010 2000 1080 0006 0100 0000 9010 2001 1080 0003
0003140  0100 0000 9010 2000 b010 0008 81c7 e008 81e8 0000 033f ffff 8200 6398 9de3 8001 1100 00f0 d002 23c8 9210 2100 d406 0000
0003220  4000 e68c 0100 0000 8090 0008 0280 0010 0100 0000 d006 2020 9002 2001 d026 2020 1300 00f0 d202 63c8 d227 bffc d006 2004
0003300  1300 00f1 9212 608f d407 bffc 4000 e680 0100 0000 10bf ffeb 0100 0000 9010 2000 b010 0008 81c7 e008 81e8 0000 033f ffff
0003360  8200 6398 9de3 8001 f227 a048 d006 2020 d207 a048 80a2 0009 1280 0005 0100 0000 9010 2001 1080 0046 0100 0000 d407 a048
0003440  d606 2020 80a2 800b 1680 000a 0100 0000 9010 27d1 9210 2053 1500 00f1 9412 a092 d606 2020 d807 a048 4000 24de 0100 0000
0003520  d807 a048 da06 2020 9e23 000d de27 bffc e007 bffc 8090 0010 0280 002d 0100 0000 1100 00f0 d002 23c8 9210 2100 d406 0000
0003600  4000 e650 0100 0000 1300 00f0 d022 63c8 1500 00f0 d402 a3c8 8090 000a 1280 000f 0100 0000 9010 27d2 9210 2057 1500 00f1
0003660  9412 a0bd 4000 24c3 0100 0000 d007 a048 d207 bffc 9422 0009 d426 2020 9010 2000 1080 0017 0100 0000 1700 00f0 d602 e3c8
0003740  d627 bff8 d006 2004 1300 00f1 9212 60e3 d407 bff8 4000 e636 0100 0000 d806 2020 9803 2001 d826 2020 da07 bffc 9a23 6001
0004020  da27 bffc 10bf ffd3 0100 0000 9010 2001 1080 0003 0100 0000 9010 2000 b010 0008 81c7 e008 81e8 0000 033f ffff 8200 63a0
0004100  9de3 8001 f027 a044 f227 a048 f427 a04c d007 a044 d207 a048 d407 a04c 9610 2001 4000 001a 0100 0000 1080 0003 0100 0000
0004160  9010 2000 b010 0008 81c7 e008 81e8 0000 033f ffff 8200 63a0 9de3 8001 f027 a044 f227 a048 f427 a04c d007 a044 d207 a048
0004240  d407 a04c 9610 2000 4000 0008 0100 0000 1080 0003 0100 0000 9010 2000 b010 0008 81c7 e008 81e8 0000 033f ffff 8200 6388
0004320  9de3 8001 f227 a048 f427 a04c f627 a050 c027 bffc 1100 00f0 d002 23c0 d027 bff8 1300 00f0 d202 63c0 d227 bff4 1500 00f0
0004400  d402 a3c4 d427 bff0 d607 a049 8090 000b 1280 000a 0100 0000 d007 a04c 1300 00f1 9212 60e6 4000 e5ed 0100 0000 9010 2001
0004460  1080 00a8 0100 0000 d007 bff4 c02a 0000 d207 bff0 c02a 4000 1100 00f0 d002 23c8 9210 2200 d406 0000 4000 e5da 0100 0000
0004540  8090 0008 0280 0095 0100 0000 d006 2020 9002 2001 d026 2020 1300 00f0 d202 63c8 8090 0009 0280 000b 0100 0000 1100 00f0
0004620  d002 23c8 1300 00f1 9212 60e8 d407 bff4 d607 bff0 4000 24f3 0100 0000 d007 bff4 8090 0008 1280 000d 0100 0000 1300 00f0
0004700  d202 63c8 d227 bfec d006 2004 1300 00f1 9212 60eb d407 bfec 4000 e5bd 0100 0000 1080 0074 0100 0000 d407 bff0 8090 000a
0004760  0280 000a 0100 0000 d607 bff4 8090 000b 0280 006c 0100 0000 d807 bff0 8090 000c 0280 0068 0100 0000 d007 bff4 d207 a048
0005040  1500 00f0 d402 a3c8 d607 a04c 4000 2441 0100 0000 8090 0008 0280 002b 0100 0000 d007 a050 8090 0008 0280 0024 0100 0000
```

```
0005120  1100 00f0 d002 23c8 8090 0008 0280 000f 0100 0000 1100 00f1 9012 20ee 1300 00f0 d202 63c8 4000 2499 0100 0000 d027 bfec
0005200  d006 2004 1300 00f1 9212 60f2 d407 bfec 4000 e58f 0100 0000 d207 bff0 8090 0009 0280 000e 0100 0000 1100 00f1 9012 20f5
0005260  d207 bff0 4000 2489 0100 0000 d027 bfec d006 2004 1300 00f1 9212 60f9 d407 bfec 4000 e57f 0100 0000 9010 2001 1080 003d
0005340  0100 0000 d007 a050 8090 0008 0280 0031 0100 0000 d007 bff4 8090 0008 0280 000e 0100 0000 1100 00f1 9012 20fc d207 bff4
0005420  4000 2472 0100 0000 d027 bfec d006 2004 1300 00f1 9212 60ff d407 bfec 4000 e568 0100 0000 d2c7 bff0 8090 0009 0280 000e
0005500  0100 0000 1100 00f1 9012 2102 d207 bff0 4000 2462 0100 0000 d027 bfec d006 2004 1300 00f1 9212 6105 d407 bfec 4000 e558
0005560  0100 0000 d407 bff4 8090 000a 1280 0006 0100 0000 d607 bff0 8090 000b 0280 0009 0100 0000 d006 2004 1300 00f1 9212 6108
0005640  1500 00f1 9412 a10b 4000 e549 0100 0000 10bf ff66 0100 0000 d807 a04c c02b 0000 9010 2000 1080 0003 0100 0000 9010 2000
0005720  b010 0008 81c7 e008 81e8 0000 033f ffff 8200 63a0 9de3 8001 1100 0124 9012 2278 4000 e53d 0100 0000 9010 2000 b010 0008
0006000  81c7 e008 81e8 0000 033f ffff 8200 63a0 9de3 8001 1100 0124 9012 2278 9210 2002 4000 e534 0100 0000 9010 2000 b010 0008
0006060  81c7 e008 81e8 0000 033f ffff 8200 63a0 9de3 8001 f22f a04b d006 2004 d202 2014 8090 0009 0280 000a 0100 0000 9010 0018
0006140  4000 e509 0100 0000 8090 0008 1280 0004 0100 0000 1080 0043 0100 0000 d006 2004 d202 2008 d4c2 6010 d606 2004 d802 e008
0006220  da03 200c 80a3 400a 0a80 0014 0100 0000 de06 2004 e003 e008 e204 2024 c204 6014 e406 2004 e604 a008 e804 e024 ea55 2010
0006300  ac10 0015 ee06 2004 dc05 e008 9002 0016 d24f a04b 920a 60ff 9fc0 4000 0100 0000 1080 000d 0100 0000 f206 2004 f406 6008
0006360  f606 a00c b606 e001 f626 a00c b826 e001 d04f a04b 912a 2018 913a 2018 d02f 0000 900a 20ff 80a2 3fff 1280 000e 0100 0000
0006440  d006 2004 d202 200c 9212 6003 d222 200c d406 2004 d602 a010 9612 e003 d622 a010 d806 2004 da03 2010 9a13 6003 da23 2010
0006520  de06 2004 e003 e01c 8090 0010 0280 0008 0100 0000 9010 0018 4000 e4ca 0100 0000 a210 2000 1080 0003 0100 0000 a210 2000
0006600  9010 0018 1080 0003 0100 0000 9010 200c b010 0008 81c7 e008 81e8 0000 033f ffff 8200 6398 9de3 8001 f227 a048 1100 0000
0006660  9012 2000 d207 a048 4000 e4d1 0100 0000 1300 00f1 9212 6198 4000 e4cd 0100 0000 d206 2008 952a 6002 1700 00f5 9612 e314
0006740  d202 800b 4000 e4c6 0100 0000 1300 00f1 9212 61ab 4000 e4c2 0100 0000 d806 2008 80a3 2001 1280 000d 0100 0000 1100 0000
0007020  9012 2000 d206 200c 4000 e4b9 0100 0000 1300 00f1 9212 61bb 4000 e4b5 0100 0000 1080 002f 0100 0000 da06 2008 80a3 6002
0007100  1280 000d 0100 0000 1100 0000 9012 2000 d206 200c 4000 e4ad 0100 0000 1300 00f1 9212 61bd 4000 e4a6 0100 0000 1080 0020
0007160  0100 0000 de06 2008 80a3 e003 1280 0012 0100 0000 1100 0000 9012 2000 c106 200c 85a0 1920 c523 a060 d203 a060 c723 a060
0007240  d403 a060 4000 e49c 0100 0000 1300 00f1 9212 61bf 4000 e492 0100 0000 1080 000c 0100 0000 1100 0000 9012 2000 1300 00f1
0007320  9212 61c1 4000 e48a 0100 0000 1300 00f1 9212 61ca 4000 e486 0100 0000 9010 2060 b010 0008 81c7 e008 81e8 0000 033f ffff
0007400  8200 63a0 9de3 8001 f227 a048 f427 a04c d007 a048 1300 00f1 9212 61cc 4000 e481 0100 0000 8090 0008 1280 0006 0100 0000
0007460  9010 2001 d026 2008 1080 0026 0100 0000 d007 a048 1300 00f1 9212 61d3 4000 e475 0100 0000 8090 0008 1280 0006 0100 0000
0007540  9210 2002 d226 2008 1080 001a 0100 0000 d007 a048 1300 00f1 9212 61db 4000 e469 0100 0000 8090 0008 1280 0006 0100 0000
0007620  9410 2003 d426 2008 1080 000e 0100 0000 c026 2008 d007 a04c 8090 0008 1280 0009 0100 0000 9010 23ed 9210 2053 1500 00f1
0007700  9412 a1e1 d607 a048 4000 22be 0100 0000 9010 2000 b010 0008 81c7 e008 81e8 0000 033f ffff 8200 63a0 9de3 8001 f027 a044
0007760  f227 a048 d007 a044 d202 2008 d407 a048 80a2 400a 0280 000b 0100 0000 9010 23eb 9210 2053 1500 00f1 9412 a1f7 4000 22a9
0010040  0100 0000 9010 2000 1080 0006 0100 0000 9010 2001 1080 0003 0100 0000 9010 2000 b010 0008 81c7 e008 81e8 0000 033f ffff
0010120  8200 63a0 9de3 8001 1100 0124 9012 2280 4000 e421 0100 0000 9010 2000 b010 0008 81c7 e008 81e8 0000 033f ffff 8200 63a0
0010200  9de3 8001 1100 0124 9012 2280 9210 2002 4000 e418 0100 0000 9010 2000 b010 0008 81c7 e008 81e8 0000 033f ffff 8200 63a0
0010260  9de3 8001 f227 a048 1100 0000 9012 2000 d207 a048 4000 e40e 0100 0000 1300 00f1 9212 6216 4000 e40a 0100 0000 d006 2008
0010340  d202 0000 c202 600c d406 2008 d602 8000 d852 e008 9a10 000c d006 2008 9002 000d 1300 00f1 9212 6218 9fc0 4000 0100 0000
0010420  9010 2000 b010 0008 81c7 e008 81e8 0000 033f ffff 8200 63c0 9de3 8001 f027 a044 f227 a048 9010 3fff 1080 0003 0100 0000
*
0010560  9010 2000 b010 0008 81c7 e008 81e8 0000 033f ffff 8200 63c0 9de3 8001 f027 a044 f227 a048 f427 a04c f627 a050 9010 2000
0010640  b010 0008 81c7 e008 81e8 0000 033f ffff 8200 63c0 9de3 8001 f027 a044 f227 a048 f427 a04c 9010 2000 b010 0008 81c7 e008
0010720  81e8 0000 033f ffff 8200 63c0 9de3 8001 f027 a044 f227 a048 f427 a04c 9010 2000 b010 0008 81c7 e008 81e8 0000 033f ffff
0011000  8200 63c0 9de3 8001 f027 a044 f227 a048 f427 a04c 9010 2000 1080 0003 0100 0000 9010 2000 b010 0008 81c7 e008 81e8 0000
0011060  033f ffff 8200 63c0 9de3 8001 f027 a044 f227 a048 9010 2000 1080 0003 0100 0000 9010 2000 b010 0008 81c7 e008 81e8 0000
0011140  033f ffff 8200 63c0 9de3 8001 f027 a044 f227 a048 9010 3fff 1080 0003 0100 0000 9010 2000 b010 0008 81c7 e008 81e8 0000
0011220  033f ffff 8200 63a0 9de3 8001 f22f a04b d006 2004 d202 2014 8090 0009 0280 000a 0100 0000 9010 0018 4000 e373 0100 0000
0011300  8090 0008 1280 0004 0100 0000 1080 0043 0100 0000 d006 2004 d202 2008 d402 6010 d606 2004 d802 e008 da03 200c 80a3 400a
0011360  0a80 0014 0100 0000 de06 2004 e003 e008 e204 2024 c204 6014 e406 2004 e604 a008 e804 e024 ea55 2010 ac10 0015 ee06 2004
0011440  d005 e008 9002 0016 d24f a04b 920a 60ff 9fc0 4000 0100 0000 1080 000d 0100 0000 f206 2004 f406 6008 f606 a00c b606 e001
0011520  f626 a00c b826 e001 d04f a04b 912a 2018 913a 2018 d02f 0000 900a 20ff 80a2 3fff 1280 000e 0100 0000 d006 2004 d202 200c
0011600  9212 6003 d222 200c d406 2004 d602 a010 9612 e003 d622 a010 d806 2004 da03 2010 9a13 6003 da23 2010 de06 2004 e003 e01c
0011660  8090 0010 0280 0008 0100 0000 9010 0018 4000 e334 0100 0000 a210 2000 1080 0003 0100 0000 a210 2030 9010 0018 1080 0003
0011740  0100 0000 9010 2000 b010 0008 81c7 e008 81e8 0000 033f ffff 8200 63a0 9de3 8001 8090 0018 1280 0009 0100 0000 9010 203c
0012020  4000 e323 0100 0000 b010 0008 8090 0008 0280 0042 0100 0000 9010 0018 9210 2000 4000 232d 0100 0000 b010 0008 1100 00f1
0012100  d002 22c0 d026 0000 9206 2024 8090 0009 1280 0008 0100 0000 9010 200c 4000 e310 0100 0000 8090 0008 0280 000a 0100 0000
0012160  1500 00f1 d402 a2d0 d426 202c c026 2028 c026 2024 9610 2000 1080 0003 0100 0000 9610 2000 9806 2024 1b00 00f1 da03 62cc
```

```
0012240  da26 202c 9e06 2024 a006 2030 8090 0010 1280 0008 0100 0000 9010 200c 4000 e2f8 0100 0000 8090 0008 0280 000a 0100 0000
0012320  2300 00f1 e204 62d0 e226 2038 c026 2034 c026 2030 a410 2000 1080 0003 0100 0000 a410 2000 a606 2030 2900 00f1 e805 22cc
0012400  e826 2038 aa06 2030 c026 2008 c026 200c c026 2010 c026 2018 c026 201c c026 2020 ac10 3fff ec26 2014 9010 0018 1080 0003
0012460  0100 0000 9010 2000 b010 0008 81c7 e008 81e8 0000 033f ffff 8200 63a0 9de3 8001 f227 a048 1100 0000 9012 2000 d207 a048
0012540  4000 e2e7 0100 0000 d206 2008 4000 e2e4 0100 0000 1300 00f1 9212 6300 4000 e2e0 0100 0000 d206 200c 4000 e2dd 0100 0000
0012620  1300 00f1 9212 6302 4000 e2d9 0100 0000 d206 2010 4000 e2d6 0100 0000 1300 00f1 9212 6304 4000 e2d2 0100 0000 d006 2028
0012700  932a 2002 1500 00f5 9412 a324 d202 400a 1100 0000 9012 2000 4000 e2c9 0100 0000 1300 00f1 9212 6310 4000 e2c5 0100 0000
0012760  d206 2014 4000 e2c2 0100 0000 1300 00f1 9212 6317 4000 e2be 0100 0000 d606 2024 8090 000b 0280 0010 0100 0000 1100 0000
0013040  9012 2000 1300 00f1 9212 6319 4000 e2b4 0100 0000 d806 2024 d203 2008 4000 e2b0 0100 0000 1300 00f1 9212 632d 4000 e2ac
0013120  0100 0000 9006 202c 1300 00f1 9212 632f 7fff fdcf 0100 0000 9010 2000 b010 0008 81c7 e008 81e8 0000 033f ffff 8200 63a0
0013200  9de3 8001 f227 a048 d007 a048 1300 00f1 9212 6331 4000 e2a1 0100 0000 8090 0008 1280 0006 0100 0000 9010 2001 d026 2028
0013260  1080 0022 0100 0000 d007 a048 1300 00f1 9212 6334 4000 e297 0100 0000 8090 0008 1280 0006 0100 0000 9210 2002 d226 2028
0013340  1080 0016 0100 0000 d007 a048 1300 00f1 9212 6338 4000 e28b 0100 0000 8090 0008 1280 0006 0100 0000 9410 2003 d426 2028
0013420  1080 000a 0100 0000 9010 23e9 9210 2053 1500 00f1 9412 a33e d607 a049 4000 20e5 0100 0000 c026 2028 9010 2000 b010 0008
0013500  81c7 e008 81e8 0000 033f ffff 8200 6388 9de3 8001 f227 a048 f427 a04c d007 a04c 9202 2068 d227 bfec d407 bfec d427 bff8
0013560  d607 bfec d802 e004 d827 bffc 9a27 a008 de07 bffc de27 bff4 8090 000f 0280 0040 0100 0000 d007 bff4 d202 2008 d227 bff0
0013640  d407 bff0 d002 a008 d207 a048 4000 e25d 0100 0000 8090 0008 1280 0011 0100 0000 d006 2020 80a2 2002 1280 0006 0100 0000
0013720  d207 bff0 f022 6024 1080 0013 0100 0000 d406 2020 80a2 a003 1280 0009 0100 0000 d007 bff0 d202 2024 f022 6024 d407 bff0
0014000  d426 2024 1080 0008 0100 0000 9010 23ea 9210 2053 1500 00f1 9412 a356 4000 20a9 0100 0000 1080 002b 0100 0000 d607 bffc
0014060  8090 000b 0280 0013 0100 0000 d807 bffc da03 2004 8090 000d 0280 0006 0100 0000 de07 bffc e003 e004 1080 0003 0100 0000
0014140  a010 2000 e027 bffc 8090 0010 0280 0005 0100 0000 a210 2001 1080 0003 0100 0000 a210 2000 10bf ffbf 0100 0000 9010 23e9
0014220  9210 2053 1500 00f1 9412 a36a 4000 2089 0100 0000 e406 0000 c204 a00c e606 0000 e854 e008 aa10 0014 9006 0015 1300 00f1
0014300  9212 63a0 9fc0 4000 0100 0000 9010 2000 b010 0008 81c7 e008 81e8 0000 033f ffff 8200 6390 9de3 8001 f227 a048 f427 a04c
0014360  c027 bffc 1100 00f1 d002 225c 9202 2032 d407 a04c 9622 400a d627 bff0 d806 2020 80a3 2001 0280 0005 0100 0000 9010 2000
0014440  1080 0074 0100 0000 1100 0120 9012 2338 1300 00f1 9212 63b3 4000 e1e8 0100 0000 d006 2010 1300 00f1 9212 63b5 4000 e1f5
0014520  0100 0000 8090 0008 0280 000b 0100 0000 1100 0120 9012 2338 1300 00f1 9212 63ba d406 2010 4000 e1d0 0100 0000 1080 0041
0014600  0100 0000 da06 2024 8090 000d 0280 0028 0100 0000 de06 2024 d003 e014 1300 00f1 9212 63bf 4000 e1df 0100 0000 8090 0008
0014660  0280 001f 0100 0000 d006 2024 d202 2018 d227 bff8 d406 2024 d602 a01c d627 bff4 d807 bff8 da07 bff4 80a3 000d 0280 0010
0014740  0100 0000 d007 bff4 de07 bff8 9022 000f 4000 e1cf 0100 0000 9410 0008 1100 0120 9012 2338 1300 00f1 9212 63c4 4000 e1aa
0015020  0100 0000 1080 0004 0100 0000 a010 2001 e027 bffc 1080 0017 0100 0000 e206 2024 8090 0011 0280 0013 0100 0000 e406 2024
0015100  d004 a010 1300 00f1 9212 63ce 4000 e1b5 0100 0000 8090 0008 0280 000a 0100 0000 e606 2024 d404 e010 1300 00f1 9212 63d3
0015160  1100 0120 9012 2338 4000 e18f 0100 0000 e807 bffc 8090 0014 0280 0006 0100 0000 2b00 00f1 aa15 63e7 1080 0004 0100 0000
0015240  2b00 0120 aa15 6338 ea23 a05c ec06 2028 af2d a002 3300 00f5 b216 6334 d805 c019 1300 00f1 9212 63d8 d007 a048 d407 bff0
0015320  d606 2008 da06 200c 4000 e177 0100 0000 d007 a048 1080 0003 0100 0000 9010 2000 b010 0008 81c7 e008 81e8 0000 033f ffff
0015400  8200 6398 9de3 8001 f227 a048 f427 a04c 1100 00f1 d002 225c 9202 2032 d407 a04c 9622 400a d627 bffc 1900 0120 c02b 2338
0015460  da06 2014 8090 000d 0280 0013 0100 0000 d006 2014 1300 00f1 9212 63e9 4000 e175 0100 0000 8090 0008 0280 000b 0100 0000
0015540  1100 0120 9012 2338 1300 00f1 9212 63ee d406 2014 4000 e150 0100 0000 1080 0011 0100 0000 d006 2010 1300 00f1 9212 63f3
0015620  4000 e164 0100 0000 8090 0008 0280 0009 0100 0000 1100 0120 9012 2338 1300 00f1 9212 63f8 d406 2010 4000 e13f 0100 0000
0015700  1100 0120 9012 2338 4000 e15c 0100 0000 8090 0008 0280 0006 0100 0000 1900 0120 9813 2338 1080 0004 0100 0000 1900 00f2
0015760  9813 2004 d007 a048 1300 00f1 9212 63fd d407 bffc d606 2008 4000 e12b 0100 0000 d007 a048 1080 0003 0100 0000 9010 2000
0016040  b010 0008 81c7 e008 81e8 0000 033f ffff 8200 63a0 9de3 8001 f227 a048 1100 0120 c02a 2338 d007 a048 1300 00f2 9212 6006
0016120  4000 e134 0100 0000 8090 0008 0280 0038 0100 0000 d007 a048 1300 00f2 9212 600b 1500 00f1 d402 a220 1700 00f1 d602 e224
0016200  4000 203c 0100 0000 8090 0008 0280 000e 0100 0000 1100 00f1 d002 2220 4000 e12a 0100 0000 d026 2018 1100 00f1 d002 2224
0016260  4000 e125 0100 0000 d026 201c 1080 0020 0100 0000 d007 a048 1300 00f2 9212 600e 1500 00f1 d402 a220 1700 00f1 d602 e224
0016340  4000 2024 0100 0000 8090 0008 0280 000e 0100 0000 1100 00f1 d002 2220 4000 e112 0100 0000 d026 2018 1100 00f1 d002 2224
0016420  4000 e10d 0100 0000 d026 201c 1080 0008 0100 0000 d007 a048 4000 e107 0100 0000 d026 2018 d006 2018 d026 201c 9010 2000
0016500  b010 0008 81c7 e008 81e8 0000 033f ffff 8200 6398 9de3 8001 9010 001a 9210 2002 4000 0016 0100 0000 d027 bffc d007 bffc
0016560  d002 2008 1300 00f2 9212 6015 4000 e0e9 0100 0000 8090 0008 1280 0005 0100 0000 9010 2000 1080 0006 0100 0000 9010 2001
0016640  1080 0003 0100 0000 9010 2000 b010 0008 81c7 e008 81e8 0000 033f ffff 8200 63a0 9de3 8001 f227 a048 1080 005f 0100 0000
0016720  1080 000f 0100 0000 9010 0018 1080 0068 0100 0000 d006 2024 d002 2024 1080 0064 0100 0000 d006 2024 1080 0061 0100 0000
0017000  9010 2000 1080 005e 0100 0000 d006 2020 80a2 2003 1880 000b 912a 2002 1300 000f 9212 6230 d002 0009 81c2 0000 0100 0000
0017060  0000 3e00 0000 3dd8 0000 3de4 0000 3df4 1080 000f 0100 0000 d006 2024 1080 004c 0100 0000 9010 0018 1080 0049 0100 0000
0017140  d006 2024 d002 2024 1080 0045 0100 0000 9010 2000 1080 0042 0100 0000 d006 2020 80a2 2003 1880 000b 912a 2002 1300 000f
0017220  9212 62a0 d002 0009 81c2 0000 0100 0000 0000 3e70 0000 3e48 0000 3e54 0000 3e60 1080 000f 0100 0000 d006 2024 d002 2024
0017300  1080 002f 0100 0000 d006 2024 1080 002c 0100 0000 9010 0018 1080 0029 0100 0000 9010 2000 1080 0026 0100 0000 d006 2020
```

```
0017360  80a2 2003 1880 900b 912a 2002 1300 000f 9212 6310 d002 0009 81c2 0000 0100 0000 0000 3ee0 0000 3eb8 0000 3ec8 0000 3ed4
0017440  9010 23ec 9210 2053 1500 00f2 9412 a01a 4000 1ee4 0100 0000 9010 2000 1080 0010 0100 0000 d007 a048 80a2 2003 18bf fff5
0017520  912a 2002 1300 000f 9212 6368 d002 0009 81c2 0000 0100 0000 0000 3f20 0000 3dd0 0000 3e40 0000 3eb0 9010 2000 b010 0008
0017600  81c7 e008 81e8 0000 033f ffff 8200 6398 9de3 8001 d006 2020 80a2 2002 0280 0009 0100 0000 9010 0018 9210 2002 7fff ff83
0017660  0100 0000 d027 bffc 1080 0003 0100 0000 f027 bffc d007 bffc 4000 0008 0100 0000 1080 0003 0100 0000 9010 2000 b010 0008
0017740  81c7 e008 81e8 0000 033f ffff 8200 63a0 9de3 8001 d006 2020 80a2 2002 0280 0007 0100 0000 9010 0018 7fff ffe0 0100 0000
0020020  1080 002f 0100 0000 9010 0018 7fff ff4c 0100 0000 8090 0008 1280 0005 0100 0000 9010 2000 1080 0026 0100 0000 d006 2014
0020100  1300 00f2 9212 602e 4000 e036 0100 0000 8090 0008 0280 000a 0100 0000 d006 201c d206 2018 9022 0009 4000 e031 0100 0000
0020160  9002 2001 1080 0016 0100 0000 d006 2010 1300 00f2 9212 6033 4000 e026 0100 0000 8090 0008 0280 000a 0100 0000 d006 201c
0020240  d406 2018 9022 000a 4000 e021 0100 0000 9002 2001 1080 0006 0100 0000 9010 2001 1080 0003 0100 0000 9010 2000 b010 0008
0020320  81c7 e008 81e8 0000 033f ffff 8200 6390 9de3 8001 f227 a048 f427 a04c f627 a050 1100 00f1 d002 225c 9202 2032 d407 a050
0020400  9622 400a d627 bff4 d806 2020 80a3 2001 0280 000d 0100 0000 9010 0018 9210 2001 7fff ff26 0100 0000 d207 a048 d407 a04c
0020460  d607 a050 7fff ffe9 0100 0000 1080 0060 0100 0000 1b00 0120 c02b 6338 de07 a04c c02b c000 9010 0018 7fff ffa4 0100 0000
0020540  d027 bffc e007 bffc 8090 0010 1280 0008 0100 0000 e207 a048 d004 6058 d206 2008 4000 9f3e 0100 0000 d027 bffc e407 bffc
0020620  8090 0012 1280 0009 0100 0000 9010 23f3 9210 2053 1500 00f2 9412 a038 d606 2008 4000 349f 0100 0000 e607 bffc 80a4 e001
0020700  1280 0011 0100 0000 e806 2028 ab2d 2002 2d00 00f5 ac15 a334 d805 4016 1300 00f2 9212 605a 1007 a04c d407 bff4 d606 2008
0020760  da06 200c 4000 dfb0 0100 0000 1080 002c 0100 0000 c027 bff8 d007 bff8 d207 bffc 80a2 0009 1680 0026 0100 0000 d006 200c
0021040  d023 a05c d206 2028 952a 6002 1700 00f5 9612 e334 da02 800b 1300 00f2 9212 6067 d606 2008 d407 bff4 d807 bff8 1100 0120
0021120  9012 2338 4000 df98 0100 0000 d007 a04c 1300 0120 9212 6338 4000 dfba 0100 0000 d807 bff8 9803 2001 d827 bff8 da07 bff8
0021200  de07 bffc 80a3 400f 1680 0007 0100 0000 d007 a04c 1300 00f2 9212 6077 4000 dfad 0100 0000 10bf ffd9 0100 0000 d007 a04c
0021260  1080 0003 0100 0000 9010 2000 b010 0008 81c7 e008 81e8 0000 033f ffff 8200 6390 9de3 8001 f227 a048 f427 a04c f627 a050
0021340  d006 2020 80a2 2001 0280 000d 0100 0000 9010 0018 9210 2001 7fff feb0 0100 0000 d207 a048 d407 a04c d607 a050 7fff ff73
0021420  0100 0000 1080 005d 0100 0000 1300 0120 c02a 6338 d407 a04c c02a 8000 1700 00f1 d602 e25c 9802 e032 da07 a050 9e23 000d
002150c  de27 bff4 9010 0018 7fff ff28 0100 0000 d027 bff8 e007 bff8 8090 0010 1280 0008 0100 0000 e207 a048 d004 6058 d206 2008
0021560  4000 9ec2 0100 0000 d027 bff8 e407 bff8 8090 0012 1280 0009 0100 0000 9010 23f3 9210 2053 1500 00f2 9412 a07a d606 2008
0021640  4000 3423 0100 0000 e607 bff8 80a4 e001 1280 000c 0100 0000 d007 a04c 1300 00f2 9212 609c d407 bff4 d606 2008 d806 2008
0021720  4000 df39 0100 0000 1080 0028 0100 0000 c027 bffc d007 bffc d207 bff8 80a2 0009 1680 0022 0100 0000 d007 bffc d023 a05c
0022000  1100 0120 9012 2338 1300 00f2 9212 60a7 d407 bff4 d606 2008 d807 bffc da06 2008 4000 df25 0100 0000 d007 a04c 1300 0120
0022060  9212 6338 4000 df47 0100 0000 d207 bffc 9202 6001 d227 bffc d407 bffc d607 bff8 80a2 800b 1680 0007 0100 0000 d007 a04c
0022140  1300 00f2 9212 60b9 4000 df3a 0100 0000 10bf ffdd 0100 0000 d007 a04c 1080 0003 0100 0000 9010 2000 b010 0008 81c7 e008
0022220  81e8 0000 033f ffff 8200 63a0 9de3 8001 1100 0124 9012 2288 4000 df0f 0100 0000 9010 2000 b010 0008 81c7 e008 81e8 0000
0022300  033f ffff 8200 63a0 9de3 8001 1100 0124 9012 2288 9210 2002 4000 df06 0100 0000 9010 2000 b010 0008 81c7 e008 81e8 0000
0022360  033f ffff 8200 63a0 9de3 8001 f227 a048 9006 202c d207 a048 9410 2001 7fff fa7c 0100 0000 9010 2000 b010 0008 81c7 e008
0022440  81e8 0000 033f ffff 8200 63a0 9de3 8001 f227 a048 1100 0000 9012 2000 d207 a048 4000 deef 0100 0000 1300 00f2 9212 60bc
0022520  4000 deeb 0100 0000 d006 2008 d202 0000 c202 600c d406 2008 d602 8000 d852 e008 9a10 000c d006 2008 9002 000d 1300 00f2
0022600  9212 60be 9fc0 4000 0100 0000 9010 2000 b010 0008 81c7 e008 81e8 0000 033f ffff 8200 63c0 9de3 8001 f027 a044 f227 a048
0022660  9010 3fff 1080 0003 0100 0000 9010 2000 b010 0008 81c7 e008 81e8 0000 033f ffff 8200 63c0 9de3 8001 f027 a044 f227 a048
*
0023020  f427 a04c f627 a050 9010 2000 b010 0008 81c7 e008 81e8 0000 033f ffff 8200 63c0 9de3 8001 f027 a044 f227 a048 f427 a04c
0023100  9010 2000 b010 0008 81c7 e008 81e8 0000 033f ffff 8200 63c0 9de3 8001 f027 a044 f227 a048 f427 a04c 9010 2000 b010 0008
0023160  81c7 e008 81e8 0000 033f ffff 8200 63c0 9de3 8001 f027 a044 f227 a048 f427 a04c 9010 2000 1080 0003 0100 0000 9010 2000
0023240  b010 0008 81c7 e008 81e8 0000 033f ffff 8200 63c0 9de3 8001 f027 a044 f227 a048 9010 2000 1080 0003 0100 0000 9010 2000
0023320  b010 0008 81c7 e008 81e8 0000 033f ffff 8200 63c0 9de3 8001 f027 a044 f227 a048 9010 3fff 1080 0003 0100 0000 9010 2000
0023400  b010 0008 81c7 e008 81e8 0000 0000 0000 033f ffff 8200 63a0 9de3 8001 f22f a04b d006 2004 d202 2014 8090 0009 0280 000a
0023460  0100 0000 9010 0018 4000 de53 0100 0000 8090 0008 1280 0004 0100 0000 1080 0043 0100 0000 d006 2004 d202 2008 d402 6010
0023540  d606 2004 d802 e008 da03 200c 80a3 400a 0a80 c014 0100 0000 de06 2004 e003 e008 e204 2024 c204 6014 e406 2004 e604 a008
0023620  e804 e024 ea55 2010 ac10 0015 ee06 2004 1005 e008 9002 0016 d24f a04b 920a 60ff 9fc0 4000 0100 0000 1080 000d 0100 0000
0023700  f206 2004 f406 6008 f606 a00c b606 e001 f626 a00c b826 e001 d04f a04b 912a 2018 913a 2018 d02f 0000 900a 20ff 80a2 3fff
0023760  1280 c00e 0100 0000 d006 2004 d202 200c 9212 6003 d222 200c d406 2004 d602 a010 9612 e003 d622 a010 d806 2004 da03 2010
0024040  9a13 6003 da23 2010 de06 2004 e003 e01c 8090 0010 0280 0008 0100 0000 9010 0018 4000 de14 0100 0000 a210 2000 1080 0003
0024120  0100 0000 a210 2000 9010 0018 1080 0003 0100 0000 9010 2000 b010 0008 81c7 e008 81e8 0000 033f ffff 8200 63a0 9de3 8001
0024200  f227 a048 d007 a048 1300 00f2 9212 6158 4000 de24 0100 0000 8090 0008 1280 0006 0100 0000 9010 2001 d026 2014 1080 0017
0024260  0100 0000 d007 a048 1300 00f2 9212 6165 4000 de18 0100 0000 8090 0008 1280 0006 0100 0000 9210 2002 d226 2014 1080 000b
0024340  0100 0000 9010 23ea 9210 2053 1500 00f2 9412 a170 d607 a048 4000 1c72 0100 0000 9010 3fff d026 2014 9010 2000 b010 0008
0024420  81c7 e008 81e8 0000 033f ffff 8200 63a0 9de3 8001 f227 a048 1100 0000 9012 2000 d207 a048 4000 ddf2 0100 0000 1300 00f2
```

```
0024500  9212 6186 4000 ddee 0100 0000 d206 2008 4000 ddeb 0100 0000 1300 00f2 9212 61a0 4000 dde7 0100 0000 1100 0000 9012 2000
0024560  d206 200c 4000 dde2 0100 0000 1300 00f2 9212 61b0 4000 ddde 0100 0000 1100 0000 9012 2000 1300 00f2 9212 61b2 4000 ddd8
0024640  0100 0000 d206 2014 952a 6002 1700 00f5 9612 e2f8 d202 800b 4000 ddd1 0100 0000 1300 00f2 9212 61cb 4000 ddcd 0100 0000
0024720  1100 0000 9012 2000 1300 00f2 9212 61ce 4000 ddc7 0100 0000 d206 2018 4000 ddc7 0100 0000 1300 00f2 9212 61df 4000 ddc0
0025000  0100 0000 1100 0300 9012 2000 d206 201c 4000 ddbe 0100 0000 1300 00f2 9212 61fd 4000 ddb7 0100 0000 d206 2020 4000 ddb7
0025060  0100 0000 1300 00f2 9212 6221 4000 ddb0 0100 0000 9010 2000 b010 0008 81c7 e008 81e8 0000 033f ffff 8200 63c0 9de3 8001
0025140  f227 a048 d007 a048 8090 0008 1280 0005 0100 0000 9010 2001 1080 000f 0100 0000 d207 a048 d402 601c d606 201c 80a2 c00a
0025220  0680 0005 0100 0000 9010 2001 1080 0006 0100 0000 9010 2000 1080 0003 0100 0000 9010 2000 b010 0008 81c7 e008 81e8 0000
0025300  033f ffff 8200 63c0 9de3 8001 f227 a048 d007 a048 8090 0008 1280 0005 0100 0000 9010 2001 1080 000f 0100 0000 d207 a048
0025360  d402 601c d606 201c 80a2 c00a 1480 0005 0100 0000 9010 2001 1080 0006 0100 0000 9010 2000 1080 0003 0100 0000 9010 2000
0025440  b010 0008 81c7 e008 81e8 0000 033f ffff 8200 63a0 9de3 8001 1100 0124 9012 2290 4000 dd69 0100 0000 9010 2000 b010 0008
0025520  81c7 e008 81e8 0000 033f ffff 8200 63a0 9de3 8001 1100 0124 9012 2290 9210 2002 4000 dd60 0100 0000 9010 2000 b010 0008
0025600  81c7 e008 81e8 0000 033f ffff 8200 63a0 9de3 8001 f227 a048 1100 0000 9012 2000 d207 a048 4000 dd56 0100 0000 1300 00f2
0025660  9212 6223 4000 dd52 0100 0000 d006 2008 d202 0000 c202 600c d406 2008 d602 8000 d852 e008 9a10 000c d006 2008 9002 000d
0025740  1300 00f2 9212 6225 9fc0 4000 0100 0000 9010 2000 b010 0008 81c7 e008 81e8 0000 033f ffff 8200 63c0 9de3 8001 f027 a044
0026020  f227 a048 f427 a04c f627 a050 9010 2000 b010 0008 81c7 e008 81e8 0000 033f ffff 8200 63c0 9de3 8001 f027 a044 f227 a048
0026100  f427 a04c 9010 2000 b010 0008 81c7 e008 81e8 0000 033f ffff 8200 63c0 9de3 8001 f027 a044 f227 a048 f427 a04c 9010 2000
0026160  b010 0008 81c7 e008 81e8 0000 033f ffff 8200 63c0 9de3 8001 f027 a044 f227 a048 f427 a04c 9010 2000 1080 0003 0100 0000
0026240  9010 2000 b010 0008 81c7 e008 81e8 0000 033f ffff 8200 63c0 9de3 8001 f027 a044 f227 a048 9010 2000 1080 0003 0100 0000
0026320  9010 2000 b010 0008 81c7 e008 81e8 0000 033f ffff 8200 63c0 9de3 8001 f027 a044 f227 a048 9010 3fff 1080 0003 0100 0000
0026400  9010 2000 b010 0008 81c7 e008 81e8 0000 033f ffff 8200 63a0 9de3 8001 f22f a04b d006 2004 d202 2014 8090 0009 0280 000a
0026460  0100 0000 9010 0018 4000 dcd3 0100 0000 8090 0008 1280 0004 0100 0000 1080 0043 0100 0000 d006 2004 d202 2008 d402 6010
0026540  d606 2004 d802 e008 da03 200c 80a3 400a 0a80 0014 0100 0000 de06 2004 e003 e008 e204 2024 c204 6014 e406 2004 e604 a008
0026620  e804 e024 ea55 2010 ac10 0015 ee06 2004 d005 e008 9002 0016 d24f a04b 920a 60ff 9fc0 4000 0100 0000 1080 000d 0100 0000
0026700  f206 2004 f406 6008 f606 a00c b606 e001 f626 a00c b826 e001 d04f a04b 912a 2018 913a 2018 d02f 0000 900a 20ff 80a2 3fff
0026760  1280 000e 0100 0000 d006 2004 d202 200c 9212 6003 d222 200c d406 2004 d602 a010 9612 e003 d622 a010 d806 2004 da03 2010
0027040  9a13 6003 da23 2010 de06 2004 e003 e01c 8090 0010 0280 0008 0100 0000 9010 0018 4000 dc94 0100 0000 a210 2000 1080 0003
0027120  0100 0000 a210 2000 9010 0018 1080 0003 0100 0000 9010 2000 b010 0008 81c7 e008 81e8 0000 033f ffff 8200 63a0 9de3 8001
0027200  1100 0124 9012 2298 4000 dc97 0100 0000 9010 2000 b010 0008 81c7 e008 81e8 0000 033f ffff 8200 63a0 9de3 8001 1100 0124
0027260  9012 2298 9210 2002 4000 dc8e 0100 0000 9010 2000 b010 0008 81c7 e008 81e8 0000 033f ffff 8200 63a0 9de3 8001 f227 a048
0027340  1100 0000 9012 2300 d207 a048 4000 dc84 0100 0000 d206 2008 4000 dc81 0100 0000 1300 00f2 9212 62b8 4000 dc7d 0100 0000
0027420  9006 200c 1300 00f2 9212 62ba 7fff f7a0 0100 0000 9010 2000 b010 0008 81c7 e008 81e8 0000 033f ffff 8200 63a0 9de3 8001
0027500  f227 a048 1100 0300 9012 2300 d207 a048 4000 dc6b 0100 0000 1300 00f2 9212 62bc 4000 dc67 0100 0000 d006 2008 d202 0000
0027560  c202 600c d406 2008 d602 8000 d852 e008 9a10 000c d006 2008 9002 000d 1300 00f2 9212 62be 9fc0 4000 0100 0000 9010 2000
0027640  b010 0008 81c7 e008 81e8 0000 033f ffff 8200 63c0 9de3 8001 f027 a044 f227 a048 9010 3fff 1080 0003 0100 0000 9010 2000
*
0030000  b010 0008 81c7 e008 81e8 0000 033f ffff 8200 63c0 9de3 8001 f027 a044 f227 a048 f427 a04c f627 a050 9010 2000 b010 0008
0030060  81c7 e008 81e8 0000 033f ffff 8200 63c0 9de3 8001 f027 a044 f227 a048 f427 a04c 9010 2000 b010 0008 81c7 e008 81e8 0000
0030140  033f ffff 8200 63c0 9de3 8001 f027 a044 f227 a048 f427 a04c 9010 2000 b010 0008 81c7 e008 81e8 0000 033f ffff 8200 63c0
0030220  9de3 8001 f027 a044 f227 a048 f427 a04c 9010 2000 1080 0003 0100 0000 9010 2000 b010 0008 81c7 e008 81e8 0000 033f ffff
0030300  8200 63c0 9de3 8001 f027 a044 f227 a048 9010 2000 1080 0003 0100 0000 9010 2000 b010 0008 81c7 e008 81e8 0000 033f ffff
0030360  8200 63c0 9de3 8001 f027 a044 f227 a048 9010 3fff 1080 0003 0100 0000 9010 2000 b010 0008 81c7 e008 81e8 0000 0000 0000
0030440  033f ffff 8200 63a0 9de3 8001 f22f a04b d006 2004 d202 2014 8090 0009 0280 000a 0100 0000 9010 0018 4000 dbcf 0100 0000
0030520  8090 0008 1280 0004 0100 0000 1080 0043 0100 0000 d006 2004 d202 2008 d402 6010 d606 2004 d802 e008 da03 200c 80a3 400a
0030600  0a80 0014 0100 0000 de06 2004 e003 e008 e204 2024 c204 6014 e406 2004 e604 a008 e804 e024 ea55 2010 ac10 0015 ee06 2004
0030660  d005 e008 9002 0016 d24f a04b 920a 60ff 9fc0 4000 0100 0000 1080 000d 0100 0000 f206 2004 f406 6008 f606 a00c b606 e001
0030740  f626 a00c b826 e001 d04f a04b 912a 2018 913a 2018 d02f 0000 900a 20ff 80a2 3fff 1280 000e 0100 0000 d006 2004 d202 200c
0031020  9212 6003 d222 200c d406 2004 d602 a010 9612 e003 d622 a010 d806 2004 da03 2010 9a13 6003 da23 2010 de06 2004 e003 e01c
0031100  8090 0010 0280 0008 0100 0000 9010 0018 4000 db90 0100 0000 a210 2000 1080 0003 0100 0000 a210 2000 9010 0018 1080 0003
0031160  0100 0000 9010 2000 b010 0008 81c7 e008 81e8 0000 033f ffff 8200 63a0 9de3 8001 8090 0018 1280 0009 0100 0000 9010 203c
0031240  4000 db7f 0100 0000 b010 0008 8090 0008 0280 0042 0100 0000 9010 0018 9210 2000 4000 1b89 0100 0000 b010 0008 1100 00f2
0031320  d002 2328 d026 0000 9206 2024 8090 0009 1280 0008 0100 0000 9010 200c 4000 db6c 0100 0000 8090 0008 0280 000a 0100 0000
0031400  1500 00f2 d402 a398 d426 202c c026 2028 c026 2024 9610 2000 1080 0003 0100 0000 9610 2000 9806 2024 1b00 00f2 da03 6394
0031460  da26 202c 9e06 2024 a006 2030 8090 0010 1280 0008 0100 0000 9010 200c 4000 db54 0100 0000 8090 0008 0280 000a 0100 0000
0031540  2300 00f2 e204 6398 e226 2038 c026 2034 c026 2030 a410 2000 1080 0003 0100 0000 a410 2000 a606 2030 2900 00f2 e805 2394
```

```
0031620  e826 2038 aa06 2030 c026 2008 c026 200c c026 2010 c026 2018 c026 201c c026 2020 ac10 3fff ec26 2014 9010 0018 1080 0003
0031700  0100 0000 9010 2000 b010 0008 81c7 e008 81e8 0000 033f ffff 8200 63a0 9de3 8001 f227 a048 d007 a048 1300 00f2 9212 63c8
0031760  4000 db4c 0100 0000 8090 0008 1280 0006 0100 0000 9010 2003 d026 200c 1080 0023 0100 0000 d007 a048 1300 00f2 9212 63d2
0032040  4000 db40 0100 0000 8090 0008 1280 0006 0100 0000 9210 2002 d226 200c 1080 0017 0100 0000 d007 a048 1300 00f2 9212 63db
0032120  4000 db34 0100 0000 8090 0008 1280 0036 0100 0000 9410 2001 d426 200c 1080 000b 0100 0000 9010 23ea 9210 2053 1500 00f2
0032200  9412 a3e2 d607 a048 4000 198e 0100 0000 9010 3fff d026 200c 9010 2000 b010 0008 81c7 e008 81e8 0000 033f ffff 8200 63a0
0032260  9de3 8001 f227 a048 1100 0000 9012 2000 d207 a048 4000 db0e 0100 0000 1300 00f2 9212 63f7 4000 db0a 0100 0000 d206 2008
0032340  4000 db07 0100 0000 1300 00f2 9212 63f9 4000 db03 0100 0000 d206 200c 952a 6002 1700 00f5 9612 e304 d202 800b 4000 dafc
0032420  0100 0000 1300 00f3 9212 6006 4000 daf8 0100 0000 1100 0000 9012 2000 1300 00f3 9212 6008 4000 daf2 0100 0000 9006 205c
0032500  1300 00f3 9212 6021 4000 1f28 0100 0000 1100 0000 9012 2000 1300 00f3 9212 602e 4000 dae7 0100 0000 9006 2069 1300 00f3
0032560  9212 6049 4000 1f1d 0100 0000 1100 0000 9012 2000 1300 00f3 9212 6056 4000 dadc 0100 0000 9006 2074 1300 00f3 9212 6073
0032640  4000 1f12 0100 0000 1100 0000 9012 2000 1300 00f3 9212 6080 4000 dad1 0100 0000 9006 201c 1300 00f3 9212 608d 7fff fcd3
0032720  0100 0000 1100 0000 9012 2000 1300 00f3 9212 608f 4000 dac6 0100 0000 9006 2080 1300 00f3 9212 60a1 4000 1efc 0100 0000
0033000  1100 0000 9012 2000 1300 00f3 9212 60ad 4000 dabb 0100 0000 9010 2000 b010 0008 81c7 e008 81e8 0000 033f ffff 8200 63c0
0033060  9de3 8001 f22f a04b d04f a04b 9210 0008 80a2 6057 1280 0004 0100 0000 1080 0014 0100 0000 d44f a04b 9610 000a 80a2 e045
0033140  1280 0007 0100 0000 d806 208c 9803 2001 d826 208c 1080 000a 0100 0000 da4f a04b 9e10 000d 80a3 e053 1280 0005 0100 0000
0033220  e006 208c a004 2001 e026 208c 9010 2000 b010 0008 81c7 e008 81e8 0000 033f ffff 8200 63a0 9de3 8001 f227 a048 9006 201c
0033300  d207 a048 9202 601c 7fff fce3 0100 0000 1080 0003 0100 0000 9010 2000 b010 0008 81c7 e008 81e8 0000 033f ffff 8200 63a0
0033360  9de3 8001 f227 a048 9006 201c d207 a048 9202 601c 7fff fcef 0100 0000 1080 0003 0100 0000 9010 2000 b010 0008 81c7 e008
0033440  81e8 0000 033f ffff 8200 6398 9de3 8001 d006 208c 8090 0008 0280 0005 0100 0000 9010 2000 1080 006c 0100 0000 9006 2080
0033520  1300 00f3 9212 60b1 4000 1e3f 0100 0000 8090 0008 0280 005c 0100 0000 d206 203c 8090 0009 1280 0058 0100 0000 9006 2080
0033600  1300 00f3 9212 60c6 4000 1e33 0100 0000 d027 bffc 8090 0008 0280 000a 0100 0000 d007 bffc 9002 200c 9210 2001 7fff f60d
0033660  0100 0000 d007 bffc d202 2018 d226 2010 9006 2080 1300 00f3 9212 60db 4000 1e22 0100 0000 d027 bffc 8090 0008 0280 000c
0033740  0100 0000 d007 bffc 9002 200c 9210 2001 7fff f5fc 0100 0000 d407 bffc d602 a018 d626 2014 1080 0010 0100 0000 1100 0008
0034020  9012 2337 9210 2053 1500 00f3 9412 a0eb 4000 18a8 0100 0000 9010 0018 9210 2053 7fff ff7e 0100 0000 9010 2000 1080 002e
0034100  0100 0000 9006 2080 1300 00f3 9212 6111 4000 1e01 0100 0000 d027 bffc 8090 0008 0280 000c 0100 0000 d007 bffc 9002 200c
0034160  9210 2001 7fff f5db 0100 0000 d007 bffc d202 2018 d226 2018 1080 0010 0100 0000 1100 0008 9012 2337 9210 2053 1500 00f3
0034240  9412 a125 4000 1887 0100 0000 9010 0018 9210 2053 7fff ff5d 0100 0000 9010 2000 1080 000d 0100 0000 9010 2001 1080 000a
0034320  0100 0000 9010 0018 9210 2053 7fff ff53 0100 0000 9010 2000 1080 0003 0100 0000 9010 2000 b010 0008 81c7 e008 81e8 0000
0034400  033f ffff 8200 6388 9de3 8001 9006 2068 d027 bff0 d206 206c d227 bff4 9427 a010 1700 00f4 d602 e020 d627 bfec 9010 0018
0034460  1300 00f5 d202 6354 4000 0110 0100 0000 9210 0008 1100 00f3 9012 214f 4000 18e3 0100 0000 d027 bfe8 d807 bfec d003 2004
0034540  1300 00f3 9212 6160 d407 bfe8 4000 d9d8 0100 0000 1b00 00f4 da03 6020 da27 bfec de07 bfec d003 e004 1300 00f3 9212 6163
0034620  1500 00f3 9412 a166 400c d9cd 0100 0000 e007 bff4 e027 bff8 8090 0010 0280 003d 0100 0000 d007 bff8 d202 2008 d227 bffc
0034700  1500 00f4 d402 a020 d427 bfec d007 bffc 1300 00f5 d202 6354 9410 200d 7fff f7c0 0100 0000 d027 bfe8 d607 bfec d002 e004
0034760  1300 00f3 9212 6174 d407 bfe8 4000 d9b4 0100 0000 d807 bff4 8090 000c 0280 0013 0100 0000 da07 bff4 de03 6004 8090 000f
0035040  0280 0006 0100 0000 e007 bff4 e204 2004 1080 0003 0100 0000 a210 2000 e227 bff4 8090 0011 0280 0005 0100 0000 a410 2001
0035120  1080 0003 0100 0000 a410 2000 e607 bff4 8090 0013 0280 000d 0100 0000 2900 00f4 e805 2020 e827 bfec ea07 bfec d005 6004
0035200  1300 00f3 9212 6177 1500 00f3 9412 a17a 4000 d98f 0100 0000 10bf ffc2 0100 0000 2d00 00f4 ec05 a020 ec27 bfec ee07 bfec
0035260  d005 e004 1300 00f3 9212 617d 1500 00f3 9412 a180 4000 d982 0100 0000 3300 00f4 f206 6020 f227 bfec f407 bfec d006 a004
0035340  1300 00f3 9212 6184 1500 00f3 9412 a187 4000 d977 0100 0000 9010 2000 b010 0008 81c7 e008 81e8 0000 033f ffff 8200 6388
0035420  9de3 8001 9006 2068 d027 bff0 d206 206c d227 bff4 9427 a010 1700 00f4 d602 e020 d627 bfec 9010 0018 1300 00f5 d202 6354
0035500  4000 00a2 0100 0000 9210 0008 1100 00f3 9012 219a 4000 1861 0100 0000 d027 bfe8 d807 bfec d003 2004 1300 00f3 9212 61a2
0035560  d407 bfe8 4000 d956 0100 0000 1b00 00f4 da03 6020 da27 bfec 9010 0018 1300 00f5 d202 6354 4000 0079 0100 0000 9210 0008
0035640  1100 00f3 9012 21a5 4000 184c 0100 0000 d027 bfe8 de07 bfec d003 e004 1300 00f3 9212 61b4 d407 bfe8 4000 d941 0100 0000
0035720  e007 bff4 e027 bff8 8090 0010 0280 0063 0100 0000 d007 bff8 d202 2008 d227 bffc 1500 00f4 d402 a020 d427 bfec d007 bffc
0036000  1300 00f5 d202 6354 9410 2000 7fff f7bc 0100 0000 9210 0008 1100 00f3 9012 21b7 4000 182e 0100 0000 d027 bfe8 d607 bfec
0036060  d002 e004 1300 00f3 9212 61c4 d407 bfe8 4000 d923 0100 0000 1900 00f4 d803 2020 d827 bfec d007 bffc 9210 2002 7fff f857
0036140  0100 0000 1300 00f5 d202 6354 9410 2000 7fff f7a3 0100 0000 d027 bfe8 da07 bfec d003 6004 1300 00f3 9212 61c7 d407 bfe8
0036220  4000 d90f 0100 0000 de07 bff4 8090 000f 0280 0013 0100 0000 e007 bff4 e204 2004 8090 0011 0280 0006 0100 0000 e407 bff4
0036300  e604 a004 1080 0003 0100 0000 a610 2000 e627 bff4 8090 0013 0280 0005 0100 0000 a810 2001 1080 0003 0100 0000 a810 2000
0036360  ea07 bff4 8090 0015 0280 000f 0100 0000 2d00 00f4 ec05 a020 ec27 bfec ee07 bfec d005 e004 1300 00f3 9212 61ca 1500 00f3
0036440  9412 a1cd 4000 d8ea 0100 0000 1080 000d 0100 0000 3300 00f4 f206 6020 f227 bfec f407 bfec d006 a004 1300 00f3 9212 61d0
0036520  1500 00f3 9412 a1d3 4000 d8dd 0100 0000 10bf ff9c 0100 0000 9010 2000 b010 0008 81c7 e008 81e8 0000 033f ffff 8200 63a0
0036600  9de3 8001 f227 a048 d007 a048 1300 00f3 9212 61d7 d406 2008 d606 2038 d806 2024 da06 202c 4000 d8c4 0100 0000 d007 a048
0036660  1080 0003 0100 0000 9010 2000 b010 0008 81c7 e008 81e8 0000 033f ffff 8200 63a0 9de3 8001 f027 a044 f227 a048 d007 a044
```

```
0036740  d402 2038 1300 00f3 9212 61e4 d007 a048 4000 d8b1 0100 0000 d007 a048 1080 0003 0100 0000 9010 2000 b010 0008 81c7 e008
0037020  81e8 0000 033f ffff 8200 63a0 9de3 8001 9206 2068 9010 0018 4000 000e 0100 0000 9206 205c 9010 0018 4000 000a 0100 0000
0037100  9206 2074 9010 0018 4000 0006 0100 0000 9010 2000 b010 0008 81c7 e008 81e8 0000 033f ffff 8200 6300 9de3 8001 f227 a048
0037160  d007 a048 d027 bff0 d207 a048 d402 6004 9427 bff4 9627 a010 d807 bff4 d827 bffc 8090 000c 0280 003c 0100 0000 d007 bffc
0037240  d202 2008 d227 bff8 d007 bff8 9210 2002 7fff f7c2 0100 0000 8090 0008 0280 0010 0100 0000 d007 bff8 9210 2001 7fff f7bb
0037320  0100 0000 8090 0008 0280 0009 0100 0000 d007 bff8 9210 2003 7fff f7b4 0100 0000 8090 0008 1280 000c 0100 0000 9010 27d2
0037400  9210 2053 1500 00f3 9412 a1e8 4000 16ed 0100 0000 9010 0018 9210 2053 7fff fdc3 0100 0000 d007 bff4 8090 0008 0280 0013
0037460  0100 0000 d207 bff4 d402 6004 8090 000a 0280 0006 0100 0000 d607 bff4 d802 e004 1080 0003 0100 0000 9810 2000 d827 bff4
0037540  8090 000c 0280 0005 0100 0000 9a10 2001 1080 0003 0100 0000 9a10 2000 10bf ffc3 0100 0000 9010 2000 b010 0008 81c7 e008
0037620  81e8 0000 033f ffff 8200 6390 9de3 8001 9006 2080 1300 00f3 9212 6205 4000 1c2a 0100 0000 d027 bffc 8090 0008 0280 0034
0037700  0100 0000 d007 bffc 9002 200c 9210 2001 7fff f404 0100 0000 d007 bffc d202 2018 d227 bff4 8090 0009 0280 0029 0100 0000
0037760  d007 bff4 4000 170a 0100 0000 9210 0008 9006 2068 4000 1c14 0100 0000 d027 bff8 8090 0008 0280 0010 0100 0000 d007 bff8
0040040  9210 2002 7fff f765 0100 0000 d027 bff8 d007 bff8 d202 2018 d407 bff8 d002 a01c 9022 0009 4000 d83a 0100 0000 1080 0014
0040120  0100 0000 1100 0008 9012 2333 9210 2053 1500 00f3 9412 a215 d607 bff4 1900 00f3 9813 2233 4000 1693 0100 0000 9010 0018
0040200  9210 2053 7fff fd69 0100 0000 9010 2000 1080 0003 0100 0000 9010 2000 b010 0008 81c7 e008 81e8 0000 033f ffff 8200 6398
0040260  9de3 8001 d006 2058 8090 0008 0280 000d 0100 0000 d206 2058 d402 6004 8090 000a 1280 0005 0100 0000 9010 2001 1080 0003
0040340  0100 0000 9010 2000 1080 003a 0100 0000 9606 201c d627 bffc d807 bffc d403 201c d206 2008 1100 00f3 9012 2243 4000 d814
0040420  0100 0000 d006 2014 d206 2010 4000 9a1c 0100 0000 d026 2058 8090 0008 1280 0005 0100 0000 9010 2000 1080 0026 0100 0000
0040500  da06 2058 de03 6014 c203 e014 e006 2058 e204 2014 e454 6010 a610 0012 d006 2058 9002 0013 d206 2018 9fc0 4000 0100 0000
0040560  e806 2058 ea05 2014 c205 601c ec06 2058 ee05 a014 f255 e018 b410 0019 d006 2058 9002 001a 9210 0018 9fc0 4000 0100 0000
0040640  f606 2058 f806 e004 8090 001c 1280 0005 0100 0000 9010 2001 1080 0003 0100 0000 9010 2000 1080 0003 0100 0000 9010 2000
0040720  b010 0008 81c7 e008 81e8 0000 033f ffff 8200 6390 9de3 8001 d006 2058 8090 0008 0280 005f 0100 0000 9010 0018 1300 00f2
0041000  d202 62c8 7fff fedd 0100 0000 9410 0008 1100 00f5 d002 2354 1300 00f3 9212 627c d606 2010 4000 d7a4 0100 0000 1100 00f4
0041060  d002 2020 d027 bffc 1300 00f5 d202 6354 d227 bff8 d407 bffc d002 a008 1300 00f3 9212 62a5 d407 bff8 4000 d79d 0100 0000
0041140  9606 201c d627 bff4 d807 bff4 da03 200c 1f00 00f2 da23 e2c8 1100 00f5 d002 2354 1300 00f3 9212 62a8 d406 2010 1700 00f2
0041220  d602 e2c8 4000 d788 0100 0000 2100 00f4 e004 2020 e027 bffc 2300 00f5 e204 6354 e227 bff8 e407 bffc d004 a008 1300 00f3
0041300  9212 62c4 d407 bff8 4000 d791 0100 0000 e606 2058 e804 e014 c205 2024 ea06 2058 ec05 6014 ee55 a020 b210 0017 d006 2058
0041360  9002 0019 1300 00f5 d202 6354 9fc0 4000 0100 0000 3500 00f5 d026 a354 3700 00f4 f606 e020 f627 bffc 3900 00f5 f807 2354
0041440  f827 bff8 fa07 bffc d007 6008 1300 00f3 9212 62c7 d407 bff8 4000 d765 0100 0000 1100 00f4 d002 2020 d027 bffc d207 bffc
0041520  d002 6008 1300 00f3 9212 62ca 1500 00f3 9412 a2cd 4000 d75a 0100 0000 9010 2000 b010 0008 81c7 e008 81e8 0000 033f ffff
0041600  8200 6388 9de3 8001 9006 2068 d027 bff0 d206 206c d227 bff4 9427 a010 1700 00f4 d602 e020 d627 bfec d807 bfec d003 200c
0041660  1300 00f3 9212 62ee 1500 00f3 9412 a2f1 4000 d743 0100 0000 1b00 00f4 da03 6020 da27 bfec 9010 0018 1300 00f5 d202 6354
0041740  7fff fe66 0100 0000 9210 0008 1100 00f3 9012 22fa 4000 1639 0100 0000 d027 bfe8 de07 bfec d003 e00c 1300 00f3 9212 6308
0042020  d407 bfe8 4000 d72e 0100 0000 2100 00f4 e004 2020 e027 bfec e207 bfec d004 600c 1300 00f3 9212 630b 1500 00f3 9412 a30e
0042100  4000 d723 0100 0000 e407 bff4 e427 bff8 8090 0012 0280 003d 0100 0000 d007 bff8 d202 2008 d227 bffc 1500 00f4 d402 a020
0042160  d427 bfec d007 bffc 1300 00f5 d202 6354 9410 200e 7fff f516 0100 0000 d027 bfe8 d607 bfec d002 e00c 1300 00f3 9212 631d
0042240  d407 bfe8 4000 d70a 0100 0000 d807 bff4 8090 000c 0280 0013 0100 0000 da07 bff4 de03 6004 8090 000f 0280 0006 0100 0000
0042320  e007 bff4 e204 2004 1080 0003 0100 0000 a210 2000 e227 bff4 8090 0011 0280 0005 0100 0000 a410 2001 1080 0003 0100 0000
0042400  a410 2000 e607 bff4 8090 0013 0280 000d 0100 0000 2900 00f4 e805 2020 e827 bfec ea07 bfec d005 600c 1300 00f3 9212 6320
0042460  1500 00f3 9412 a323 4000 d6e5 0100 0000 10bf ffc2 0100 0000 2d00 00f4 ec05 a020 ec27 bfec ee07 bfec d005 e00c 1300 00f3
0042540  9212 6326 1500 00f3 9412 a329 4000 d6d8 0100 0000 3300 00f4 f206 6020 f227 bfec 9010 0018 1300 00f5 d202 6354 7fff fdfb
0042620  0100 0000 9210 0008 1100 00f3 9012 232d 4000 15ce 0100 0000 d027 bfe8 f407 bfec d006 a00c 1300 00f3 9212 6337 d407 bfe8
0042700  4000 d6c3 0100 0000 9010 2000 b010 0008 81c7 e008 81e8 0000 033f ffff 8200 6388 9de3 8001 9006 2068 d027 bff0 d206 206c
0042760  d227 bff4 9427 a010 1700 00f4 d602 e020 d627 bfec 9010 0018 1300 00f5 d202 6354 7fff fdda 0100 0000 9210 0008 1100 00f3
0043040  9012 233a 4000 15ad 0100 0000 d027 bfe8 d807 bfec d003 200c 1300 00f3 9212 635e d407 bfe8 4000 d6a2 0100 0000 1b00 00f4
0043120  da03 6020 da27 bfec 9010 0018 1300 00f5 d202 6354 7fff fdc5 0100 0000 9210 0008 1100 00f3 9012 2361 4000 1598 0100 0000
0043200  d027 bfe8 de07 bfec d003 e00c 1300 00f3 9212 6375 d407 bfe8 4000 d68d 0100 0000 2100 00f4 e004 2020 e027 bfec e207 bfec
0043260  d004 600c 1300 00f3 9212 6378 1500 00f3 9412 a37b 4000 d682 0100 0000 e407 bff4 e427 bff8 8090 0012 0280 003e 0100 0000
0043340  d007 bff8 d202 2008 d227 bffc 1500 00f4 d402 a020 d427 bfec d007 bffc 9210 0018 1500 00f5 d402 a354 9610 200d 7fff f673
0043420  0100 0000 d027 bfe8 d607 bfec d002 e00c 1300 00f3 9212 6389 d407 bfe8 4000 d668 0100 0000 d807 bff4 8090 000c 0280 0013
0043500  0100 0000 da07 bff4 de03 6004 8090 000f 0280 0006 0100 0000 e007 bff4 e204 2004 1080 0003 0100 0000 a210 2000 e227 bff4
0043560  8090 0011 0280 0005 0100 0000 a410 2001 1080 0003 0100 0000 a410 2000 e607 bff4 8090 0013 0280 000d 0100 0000 2900 00f4
0043640  e805 2020 e827 bfec ea07 bfec d005 600c 1300 00f3 9212 638c 1500 00f3 9412 a38f 4000 d643 0100 0000 10bf ffc1 0100 0000
0043720  2d00 00f4 ec05 a020 ec27 bfec ee07 bfec d005 e00c 1300 00f3 9212 6392 1500 00f3 9412 a395 4000 d636 0100 0000 3300 00f4
0044000  f206 6020 f227 bfec f407 bfec d006 a00c 1300 00f3 9212 63a9 1500 00f3 9412 a3ac 4000 d62b 0100 0000 3700 00f4 f606 e020
```

```
0044060  f627 bfec 9010 0018 1300 00f5 d202 6354 7fff f44e 0100 0000 9210 0008 1100 00f3 9012 23b3 4000 1521 0100 0000 d027 bfe8
0044140  f807 bfec d007 200c 1300 00f3 9212 63c1 d407 bfe8 4000 d616 0100 0000 3b00 00f4 fa07 6020 fa27 bfec d007 bfec d002 200c
0044220  1300 00f3 9212 63c4 1500 00f3 9412 a3c7 4000 d60b 0100 0000 d207 bff0 8090 0009 0280 0007 0100 0000 d407 bff0 d602 a004
0044300  d627 bff4 1080 0003 0100 0000 9610 2000 d807 bff4 d827 bff8 8090 000c 0280 003e 0100 0000 d007 bff8 d202 2008 d227 bffc
0044360  1500 00f4 d402 a020 d427 bfec d007 bffc 9210 0018 1500 00f5 d402 a354 9610 2018 7fff f66e 0100 0000 d027 bfe8 d607 bfec
0044440  d602 e00c 1300 00f3 9212 63e0 d407 bfe8 4000 d5e7 0100 0000 d807 bff4 8090 000c 0280 0013 0100 0000 da07 bff4 de03 6004
0044520  8090 000f 0280 0006 0100 0000 e007 bff4 e204 2004 1080 0003 0100 0000 a210 2000 e227 bff4 8090 0011 0280 0005 0100 0000
0044600  a410 2001 1080 0003 0100 0000 a410 2000 e607 bff4 8090 0013 0280 000d 0100 0000 2900 00f4 e805 2020 e827 bfec ea07 bfec
0044660  d005 600c 1300 00f3 9212 63e3 1500 00f3 9412 a3e6 4000 d5c2 0100 0000 10bf ffc1 0100 0000 2d00 00f4 ec05 a020 ec27 bfec
0044740  ee07 bfec d005 e00c 1300 00f3 9212 63e9 1500 00f3 9412 a3ec 4000 d5b5 0100 0000 3300 00f4 f206 6020 f227 bfec f407 bfec
0045020  d006 a00c 1300 00f3 9212 63f0 1500 00f3 9412 a3f3 4000 d5aa 0100 0000 9010 2000 b010 0008 81c7 e008 81e8 0000 033f ffff
0045100  8200 63a0 9de3 8001 1100 0124 9012 22a0 4000 d5a5 0100 0000 9010 2050 4000 d590 0100 0000 1300 00f2 d022 62c8 9010 2000
0045160  b010 0008 81c7 e008 81e8 0000 033f ffff 8200 63a0 9de3 8001 1100 0124 9012 22a0 9210 2002 4000 d597 0100 0000 9010 2000
0045240  b010 0008 81c7 e008 81e8 0000 033f ffff 8200 63a0 9de3 8001 f227 a048 1100 0000 9012 2000 d207 a048 4000 d58d 0100 0000
0045320  d206 2008 4000 d58a 0100 0000 1300 00f4 9212 600d 4000 d586 0100 0000 9006 200c 1300 00f4 9212 600f 7fff f0a9 0100 0000
0045400  9010 2000 b010 0008 81c7 e008 81e8 0000 033f ffff 8200 63a0 9de3 8001 f227 a048 9006 202c d207 a048 9410 2001 7fff f0f4
0045460  0100 0000 9010 2000 b010 0008 81c7 e008 81e8 0000 033f ffff 8200 63a0 9de3 8001 f227 a048 1100 0000 9012 2000 d207 a048
0045540  4000 d567 0100 0000 1300 00f4 9212 6011 4000 d563 0100 0000 d006 2008 d202 0000 c202 600c d406 2008 d602 8000 d852 e008
0045620  9a10 000c d006 2008 9002 000d 1300 00f4 9212 6013 9fc0 4000 0100 0000 9010 2000 b010 0008 81c7 e008 81e8 0000 033f ffff
0045700  8200 63c0 9de3 8001 f027 a044 f227 a048 9010 3fff 1080 0003 0100 0000 9010 2000 b010 0008 81c7 e008 81e8 0000 033f ffff
*
0046040  8200 63c0 9de3 8001 f027 a044 f227 a048 f427 a04c f627 a050 9010 2000 b010 0008 81c7 e008 81e8 0000 033f ffff 8200 63c0
0046120  9de3 8001 f027 a044 f227 a048 f427 a04c 9010 2000 b010 0008 81c7 e008 81e8 0000 033f ffff 8200 63c0 9de3 8001 f027 a044
0046200  f227 a048 f427 a04c 9010 2000 b010 0008 81c7 e008 81e8 0000 033f ffff 8200 63c0 9de3 8001 f027 a044 f227 a048 f427 a04c
0046260  9010 2000 1080 0003 0100 0000 9010 2000 b010 0008 81c7 e008 81e8 0000 033f ffff 8200 63c0 9de3 8001 f027 a044 f227 a048
*
0046420  9010 3fff 1080 0003 0100 0000 9010 2000 b010 0008 81c7 e008 81e8 0000 0000 0000 033f ffff 8200 63a0 9de3 8001 f22f a04b
0046500  d006 2004 d202 2014 8090 0009 0280 000a 0100 0000 9010 0018 4000 d4cb 0100 0000 8090 0008 1280 0004 0100 0000 1080 0043
0046560  0100 0000 d006 2004 d202 2008 d402 6010 d606 2004 d802 e008 da03 200c 80a3 400a 0a80 0014 0100 0000 de06 2004 e003 e008
0046640  e204 2024 c204 6014 e406 2004 e604 a008 e804 e024 ea55 2010 ac10 0015 ee06 2004 d005 e008 9002 0016 d24f a04b 920a 60ff
0046720  9fc0 4000 0100 0000 1080 000d 0100 0000 f206 2004 f406 6008 f606 a00c b606 e001 f626 a00c b826 e001 d04f a04b 912a 2018
0047000  913a 2018 d02f 0000 900a 20ff 80a2 3fff 1280 000e 0100 0000 d006 2004 d202 200c 9212 6003 d222 200c d406 2004 d602 a010
0047060  9612 e003 d622 a010 d806 2004 da03 2010 9a13 6003 da23 2010 de06 2004 e003 e01c 8090 0010 0280 0008 0100 0000 9010 0018
0047140  4000 d48c 0100 0000 a210 2000 1080 0003 0100 0000 a210 2000 9010 0018 1080 0003 0100 0000 9010 2000 b010 0008 81c7 e008
0047220  81e8 0000 033f ffff 8200 63a0 9de3 8001 8090 0018 1280 0009 0100 0000 9010 203c 4000 d47b 0100 0000 b010 0008 8090 0008
0047300  0280 0042 0100 0000 9010 0018 9210 2000 4000 1485 0100 0000 b010 0008 1100 00f4 d002 2084 d026 0000 9206 2024 8090 0009
0047360  1280 0008 0100 0000 9010 200c 4000 d468 0100 0000 8090 0008 0280 000a 0100 0000 1500 00f4 d402 a090 d426 202c c026 2028
0047440  c026 2024 9610 2000 1080 0003 0100 0000 9610 2000 9806 2024 1b00 00f4 da03 608c da26 202c 9e06 2024 a006 2030 8090 0010
0047520  1280 0008 0100 0000 9010 200c 4000 d450 0100 0000 8090 0008 0280 000a 0100 0000 2300 00f4 e204 6090 e226 2038 c026 2034
0047600  c026 2030 a410 2000 1080 0003 0100 0000 a410 2000 a606 2030 2900 00f4 e805 208c e826 2038 aa06 2030 c026 2008 c026 200c
0047660  c026 2010 c026 2018 c026 201c c026 2020 ac10 3fff ec26 2014 9010 0018 1080 0003 0100 0000 9010 2000 b010 0008 81c7 e008
0047740  81e8 0000 033f ffff 8200 6388 9de3 8001 f227 a048 8090 0018 1280 0009 0100 0000 9010 2034 4000 d426 0100 0000 b010 0008
0050020  8090 0008 0280 0061 0100 0000 9010 0018 9210 2000 4000 1430 0100 0000 b010 0008 1100 00f4 d002 207c d026 0000 9206 201c
0050100  8090 0009 1280 0008 0100 0000 9010 200c 4000 d413 0100 0000 8090 0008 0280 000a 0100 0000 1500 00f4 d402 a090 d426 2024
0050160  c026 2020 c026 201c 9610 2000 1080 0003 0100 0000 9610 2000 9806 201c 1b00 00f4 da03 608c da26 2024 9e06 201c a006 2028
0050240  8090 0010 1280 0008 0100 0000 9010 200c 4000 d3fb 0100 0000 8090 0008 0280 000a 0100 0000 2300 00f4 e204 6090 e226 2030
0050320  c026 202c c026 2028 a410 2000 1080 0003 0100 0000 a410 2000 a606 2028 2900 00f4 e805 208c e826 2030 aa06 2028 ec07 a048
0050400  ee05 a008 ee27 bffc d007 bffc 4000 1148 0100 0000 d026 2008 9010 0018 d206 2008 4000 1435 0100 0000 f207 a048 f406 6010
0050460  f427 bff8 d007 bff8 4000 1131 0100 0000 d026 2010 f607 a048 f806 e00c f827 bff4 d007 bff4 4000 1136 0100 0000 d026 200c
0050540  fa07 a048 d007 6014 d027 bff0 d207 bff0 d226 2014 d407 a048 d602 a018 d627 bfec d807 bfec d826 2018 9010 0018 d206 2008
0050620  4000 1419 0100 0000 9010 0018 1080 0003 0100 0000 9010 2000 b010 0008 81c7 e008 81e8 0000 033f ffff 8200 63a0 9de3 8001
0050700  f227 a048 d007 a048 d202 2008 d006 2008 4000 d3d4 0100 0000 8090 0008 1280 001b 0100 0000 d207 a048 d202 6010 d006 2010
0050760  4000 d3cc 0100 0000 8090 0008 1280 0013 0100 0000 d407 a048 d202 a00c d006 200c 4000 d3c4 0100 0000 8090 0008 1280 000b
0051040  0100 0000 d607 a048 d802 e018 da06 2018 80a3 400c 1280 0005 0100 0000 9010 2001 1080 0006 0100 0000 9010 2000 1080 0003
0051120  0100 0000 9010 2000 b010 0008 81c7 e008 81e8 0000 033f ffff 8200 63b8 9de3 8001 f027 a044 f227 a048 d007 a048 8090 0008
```

```
0051200  1280 0005 0100 0000 9010 2001 1080 0012 0100 0000 d207 a048 d227 bffc d407 bffc d602 a018 d807 a044 da03 2018 80a3 400b
0051260  0680 0005 0100 0000 9010 2001 1080 0006 0100 0000 9010 2000 1080 0003 0100 0000 9010 2000 b010 0008 81c7 e008 81e8 0000
0051340  033f ffff 8200 63b8 9de3 8001 f027 a044 f227 a048 d007 a048 8090 0008 1280 0005 0100 0000 9010 2001 1080 0012 0100 0000
0051420  d207 a048 d227 bffc d407 bffc d602 a018 d807 a044 da03 2018 80a3 400b 1480 0005 0100 0000 9010 2001 1080 0006 0100 0000
0051500  9010 2000 1080 0003 0100 0000 9010 2000 b010 0008 81c7 e008 81e8 0000 033f ffff 8200 6180 9de3 8001 9027 a200 d027 bdfc
0051560  9206 201c d227 bdec d406 2020 d427 bdf0 9627 a214 1100 00f4 9012 20c0 d206 2008 4000 d373 0100 0000 1100 00f4 d002 2020
0051640  d206 2018 7fff ecd2 0100 0000 1100 00f4 d002 2020 1300 00f4 9212 60e6 d407 bdfc 7fff ed1e 0100 0000 1900 00f4 d803 2020
0051720  d827 bde8 da07 bde8 d003 6004 1300 00f4 9212 60e9 1500 00f4 9412 a0ec 4000 d338 0100 0000 1f00 00f4 de03 e020 de27 bde8
0052000  e007 bde8 d004 2004 1300 00f4 9212 60f0 1500 00f4 9412 a0f3 4000 d32d 0100 0000 e207 bdf0 e227 bdf8 8090 0011 0280 002b
0052060  0100 0000 d007 bdf8 d202 2008 d227 bdf4 d407 bdf4 d602 a08c 8090 000b 1280 000b 0100 0000 d007 bdf4 7fff fb14 0100 0000
0052140  8090 0008 0280 0005 0100 0000 d007 bdf4 7fff f924 0100 0000 d807 bdf0 8090 000c 0280 0013 0100 0000 da07 bdf0 de03 6004
0052220  8090 000f 0280 0006 0100 0000 e007 bdf0 e204 2004 1080 0003 0100 0000 a210 2000 e227 bdf0 8090 0011 0280 0005 0100 0000
0052300  a410 2001 1080 0003 0100 0000 a410 2000 10bf ffd4 0100 0000 2700 00f4 e604 e020 e627 bde8 e807 bde8 d005 2004 1300 00f4
0052360  9212 6120 d407 bdfc 4000 d2f5 0100 0000 ea07 bdec 8090 0015 0280 0007 0100 0000 ec07 bdec ee05 a004 ee27 bdf0 1080 0003
0052440  0100 0000 ae10 2000 f207 bdf0 f227 bdf8 8090 0019 0280 0059 0100 0000 d007 bdf8 d202 2008 d227 bdf4 d407 bdf4 d602 a08c
0052520  8090 000b 1280 0039 0100 0000 d007 bdf4 7fff fad2 0100 0000 8090 0008 0280 0033 0100 0000 d007 bdf4 9202 201c d227 bde4
0052600  d407 bde4 d202 a01c 1100 00f4 d002 2020 7fff ec57 0100 0000 1100 00f4 d002 2020 1300 00f4 9212 6123 d407 bdfc 7fff ecb5
0052660  0100 0000 1700 00f4 d602 e020 d627 bde8 d807 bde8 d003 2004 1300 00f4 9212 6125 1500 00f4 9412 a128 4000 d2bd 0100 0000
0052740  d007 bdf4 7fff f949 0100 0000 1b00 00f4 da03 6020 da27 bde8 de07 bde8 d003 e004 1300 00f4 9212 6152 d407 bdfc 4000 d2b0
0053020  0100 0000 d007 bdf4 7fff faf1 0100 0000 d007 bdf4 7fff fb56 0100 0000 d007 bdf4 7fff fbea 0100 0000 e007 bdf0 8090 0010
0053100  0280 0013 0100 0000 e207 bdf0 e404 6004 8090 0012 0280 0006 0100 0000 e607 bdf0 e804 e004 1080 0003 0100 0000 a810 2000
0053160  e827 bdf0 8090 0014 0280 0005 0100 0000 aa10 2001 1080 0003 0100 0000 aa10 2000 10bf ffa6 0100 0000 9010 2000 b010 0008
0053240  81c7 e008 81e8 0000 033f ffff 8200 63a0 9de3 8001 1100 0124 9012 22a8 4000 d28a 0100 0000 9010 2000 b010 0008 81c7 e008
0053320  81e8 0000 033f ffff 8200 63a0 9de3 8001 1100 0124 9012 22a8 9210 2002 4000 d281 0100 0000 9010 2000 b010 0008 81c7 e008
0053400  81e8 0000 033f ffff 8200 63a0 9de3 8001 f227 a048 1100 0000 9012 2000 d207 a048 4000 d277 0100 0000 d206 2008 4000 d274
0053460  0100 0000 1300 00f4 9212 6155 4000 d270 0100 0000 d206 200c 4000 d26d 0100 0000 1300 00f4 9212 6160 4000 d269 0100 0000
0053540  1100 0000 9012 2000 1300 00f4 9212 6163 4000 d263 0100 0000 d206 2010 4000 d260 0100 0000 1300 00f4 9212 6177 4000 d25c
0053620  0100 0000 d006 2014 932a 2002 1500 00f5 9412 a2f8 d202 400a 1100 0000 9012 2000 4000 d253 0100 0000 1300 00f4 9212 6183
0053700  4000 d24f 0100 0000 1100 0000 9012 2000 1300 00f4 9212 6186 4000 d249 0100 0000 d206 2018 4000 d249 0100 0000 1300 00f4
0053760  9212 619a 4000 d242 0100 0000 1100 0000 9012 2000 d206 201c 4000 d240 0100 0000 1100 0000 9012 2000 1300 00f4 9212 61a2
0054040  4000 d237 0100 0000 d206 2028 4000 d237 0100 0000 1100 0000 9012 2000 1300 00f4 9212 61c0 4000 d22e 0100 0000 9006 201c
0054120  1300 00f4 9212 61e2 4000 1664 0100 0000 9006 2028 1300 00f4 9212 61ee 4000 165f 0100 0000 9010 2000 b010 0008 81c7 e008
0054200  81e8 0000 033f ffff 8200 63a0 9de3 8001 f227 a048 1100 0000 9012 2000 d207 a048 4000 d217 0100 0000 1300 00f4 9212 61fe
0054260  4000 d213 0100 0000 d006 2008 d202 0000 c202 600c d406 2008 d602 8000 d852 e008 9a10 000c d006 2008 9002 000d 1300 00f4
0054340  9212 6200 9fc0 4000 0100 0000 9010 2000 b010 0008 81c7 e008 81e8 0000 033f ffff 8200 63c0 9de3 8001 f027 a044 f227 a048
0054420  f427 a04c f627 a050 9010 2000 b010 0008 81c7 e008 81e8 0000 033f ffff 8200 63c0 9de3 8001 f027 a044 f227 a048 f427 a04c
0054500  9010 2000 b010 0008 81c7 e008 81e8 0000 033f ffff 8200 63c0 9de3 8001 f027 a044 f227 a048 f427 a04c 9010 2000 b010 0008
0054560  81c7 e008 81e8 0000 033f ffff 8200 63c0 9de3 8001 f027 a044 f227 a048 f427 a04c 9010 2000 1080 0003 0100 0000 9010 2000
0054640  b010 0008 81c7 e008 81e8 0000 033f ffff 8200 63c0 9de3 8001 f027 a044 f227 a048 9010 2000 1080 0003 0100 0000 9010 2000
0054720  b010 0008 81c7 e008 81e8 0000 033f ffff 8200 63c0 9de3 8001 f027 a044 f227 a048 9010 3fff 1080 0003 0100 0000 9010 2000
0055000  b010 0008 81c7 e008 81e8 0000 0000 0000 033f ffff 8200 63a0 9de3 8001 f22f a04b d006 2004 d202 2014 8090 0009 0280 000a
0055060  0100 0000 9010 0018 4000 d193 0100 0000 8090 0008 1280 0004 0100 0000 1080 0043 0100 0000 d006 2004 d202 2008 d402 6010
0055140  d606 2004 d802 e008 da03 200c 80a3 400a 0a80 0014 0100 0000 de06 2004 e003 e008 e204 2024 c204 6014 e406 2004 e604 a008
0055220  e804 e024 ea55 2010 ac10 0015 ee06 2004 d005 e008 9002 0016 d24f a04b 920a 60ff 9fc0 4000 0100 0000 1080 000d 0100 0000
0055300  f206 2004 f406 6008 f606 a00c b606 e001 f626 a00c b826 e001 d04f a04b 912a 2018 913a 2018 d02f 0000 900a 20ff 80a2 3fff
0055360  1280 000e 0100 0000 d006 2004 d202 200c 9212 6003 d222 200c d406 2004 d602 a010 9612 e003 d622 a010 d806 2004 da03 2010
0055440  9a13 6003 da23 2010 de06 2004 e003 e01c 8090 0010 0280 0008 0100 0000 9010 0018 4000 d154 0100 0000 a210 2000 1080 0003
0055520  0100 0000 a210 2000 9010 0018 1080 0003 0100 0000 9010 2000 b010 0008 81c7 e008 81e8 0000 033f ffff 8200 63a0 9de3 8001
0055600  8090 0018 1280 0009 0100 0000 9010 203c 4000 d143 0100 0000 b010 0008 8090 0008 0280 0042 0100 0000 9010 0018 9210 2000
0055660  4000 114d 0100 0000 b010 0008 1100 00f4 d002 226c d026 0000 9206 2024 8090 0009 1280 0008 0100 0000 9010 200c 4000 d130
0055740  0100 0000 8090 0008 0280 000a 0100 0000 1500 00f4 d402 a278 d426 202c c026 2028 c026 2024 9610 2000 1080 0003 0100 0000
0056020  9610 2000 9806 2024 1b00 00f4 da03 6274 1a26 202c 9e06 2024 a006 2030 8090 0010 1280 0008 0100 0000 9010 200c 4000 d118
0056100  0100 0000 8090 0008 0280 000a 0100 0000 2300 00f4 e204 6278 e226 2038 c026 2034 c026 2030 a410 2000 1080 0003 0100 0000
0056160  a410 2000 a606 2030 2900 00f4 e805 2274 e826 2038 aa06 2030 c026 2008 c026 200c c026 2010 c026 2018 c026 201c c026 2020
0056240  ac10 3fff ec26 2014 9010 0018 1080 0003 0100 0000 9010 2000 b010 0008 81c7 e008 81e8 0000 033f ffff 8200 63a0 9de3 8001
```

```
0056320  f227 a048 1100 0000 9012 2000 d207 a048 4000 d107 0100 0000 1300 00f4 9212 62a8 4000 d103 0100 0000 d206 2008 4000 d100
0056400  0100 0000 1300 00f4 9212 62b3 4000 d0fc 0100 0000 d206 200c 4000 d0fc 0100 0000 1100 0000 9012 2000 1300 00f4 9212 62bb
0056460  4000 d0f3 0100 0000 9006 200c 1300 00f4 9212 62ca 4000 1529 0100 0000 9010 2000 b010 0008 81c7 e008 81e8 0000 033f ffff
0056540  8200 63a0 9de3 8001 f227 a048 8090 0018 0280 0018 0100 0000 d006 0000 4000 d0fb 0100 0000 d006 2004 4000 d0f8 0100 0000
0056620  d006 2008 4000 d0f5 0100 0000 d006 200c 4000 d0f2 0100 0000 8090 0018 0280 0009 0100 0000 d007 a048 808a 2001 0280 0005
0056700  0100 0000 9010 0018 4000 d0eb 0100 0000 9010 2000 b010 0008 81c7 e008 81e8 0000 033f ffff 8200 6388 9de3 8001 9006 200c
0056760  d027 bff0 d206 2010 d227 bff4 9427 a010 9010 2000 d206 2008 7fff e979 0100 0000 1700 00f4 d022 e020 1100 00f4 d002 2020
0057040  7fff e9fc 0100 0000 8090 0008 1280 0004 0100 0000 1080 003f 0100 0000 1900 00f4 d803 2020 d827 bfec da07 bfec d003 6008
0057120  1300 00f4 9212 6247 1500 00f4 9412 a2da 4000 d09b 0100 0000 1100 00f4 9012 22eb d206 2008 4000 d0ba 0100 0000 de07 bff4
0057200  de27 bffc 8090 000f 0280 0020 0100 0000 d007 bffc d202 2008 d227 bff8 d007 bff8 7fff fd2f 0100 0000 d407 bff4 8090 000a
0057260  0280 0013 0100 0000 d607 bff4 d802 e004 8090 000c 0280 0006 0100 0000 da07 bff4 de03 6004 1080 0003 0100 0000 9e10 2000
0057340  de27 bff4 8090 000f 0280 0005 0100 0000 a010 2001 1080 0003 0100 0000 a010 2000 10bf ffdf 0100 0000 1100 00f4 d002 2020
0057420  7fff e9d9 0100 0000 1100 00f4 d002 2020 9210 2003 7fff ff8e 0100 0000 9010 2000 b010 0008 81c7 e008 81e8 0000 033f ffff
0057500  8200 63a0 9de3 8001 1100 0124 9012 22b0 4000 d065 0100 0000 9010 2000 b010 0008 81c7 e008 81e8 0000 033f ffff 8200 63a0
0057560  9de3 8001 1100 0124 9012 22b0 9210 2002 4000 d05c 0100 0000 9010 2000 b010 0008 81c7 e008 81e8 0000 033f ffff 8200 63a0
0057640  9de3 8001 f227 a048 d007 a048 4000 0da0 0100 0000 d026 2008 9010 0018 d206 2008 4000 108d 0100 0000 9010 2000 b010 0008
0057720  81c7 e008 81e8 0000 033f ffff 8200 63a0 9de3 8001 f227 a048 1100 0000 9012 2000 d207 a048 4000 d042 0100 0000 1300 00f4
0060000  9212 631f 4000 d03e 0100 0000 d006 2008 d202 0000 c202 600c d406 2008 d602 8000 d852 e008 9a10 000c d006 2008 9002 000d
0060060  1300 00f4 9212 6321 9fc0 4000 0100 0000 9010 2000 b010 0008 81c7 e008 81e8 0000 033f ffff 8200 63c0 9de3 8001 f027 a044
0060140  f227 a048 9010 3fff 1080 0003 0100 0000 9010 2000 b010 0008 81c7 e008 81e8 0000 033f ffff 8200 63c0 9de3 8001 f027 a044
*
0060300  f227 a048 f427 a04c f627 a050 9010 2000 b010 0008 81c7 e008 81e8 0000 033f ffff 8200 63c0 9de3 8001 f027 a044 f227 a048
0060360  f427 a04c 9010 2000 b010 0008 81c7 e008 81e8 0000 033f ffff 8200 63c0 9de3 8001 f027 a044 f227 a048 f427 a04c 9010 2000
0060440  b010 0008 81c7 e008 81e8 0000 033f ffff 8200 63c0 9de3 8001 f027 a044 f227 a048 f427 a04c 9010 2000 1080 0003 0100 0000
0060520  9010 2000 b010 0008 81c7 e008 81e8 0000 033f ffff 8200 63c0 9de3 8001 f027 a044 f227 a048 9010 2000 1080 0003 0100 0000
0060600  9010 2000 b010 0008 81c7 e008 81e8 0000 033f ffff 8200 63c0 9de3 8001 f027 a044 f227 a048 9010 3fff 1080 0003 0100 0000
0060660  9010 2000 b010 0008 81c7 e008 81e8 0000 033f ffff 8200 63a0 9de3 8001 f22f a04b d006 2004 d202 2014 8090 0009 0280 000a
0060740  0100 0000 9010 0018 4000 cfa7 0100 0000 8090 0008 1280 0004 0100 0000 1080 0043 0100 0000 d006 2004 d202 2008 d402 6010
0061020  d606 2004 d802 e008 da03 200c 80a3 400a 0a80 0014 0100 0000 de06 2004 e003 e008 e204 2024 c204 6014 e406 2004 e604 a008
0061100  e804 e024 ea55 2010 ac10 0015 ee06 2004 d005 e008 9002 0016 d24f a04b 920a 60ff 9fc0 4000 0100 0000 1080 000d 0100 0000
0061160  f206 2004 f406 6008 f606 a00c b606 e001 f626 a00c b826 e001 d04f a04b 912a 2018 913a 2018 d02f 0000 900a 20ff 80a2 3fff
0061240  1280 000e 0100 0000 d006 2004 d202 200c 9212 6003 d222 200c d406 2004 d602 a010 9612 e003 d622 a010 d806 2004 da03 2010
0061320  9313 6003 da23 2010 de06 2004 e003 e01c 9090 0010 0290 0008 0100 0000 9010 0018 4000 cf68 0100 0000 a210 2000 1080 0003
0061400  0100 0000 a210 2000 9010 0018 1080 0003 0100 0000 9010 2000 b010 0008 81c7 e008 81e8 0000 033f ffff 8200 63a0 9de3 8001
0061460  8090 0018 1280 0009 0100 0000 9010 203c 4000 cf57 0100 0000 b010 0008 8090 0008 0280 0042 0100 0000 9010 0018 9210 2000
0061540  4000 0f61 0100 0000 b010 0008 1100 00f4 d002 2398 d026 0000 9206 2024 8090 0009 1280 0008 0100 0000 9010 200c 4000 cf44
0061620  0100 0000 8090 0008 0280 000a 0100 0000 1500 00f4 d402 a3a4 d426 202c c026 2028 c026 2024 9610 2000 1080 0003 0100 0000
0061700  9610 2000 9806 2024 1b00 00f4 da03 63a0 da26 202c 9e06 2024 a006 2030 8090 0010 1280 0008 0100 0000 9010 200c 4000 cf2c
0061760  0100 0000 8090 0008 0280 000a 0100 0000 2300 00f4 e204 63a4 e226 2038 c026 2034 c026 2030 a410 2000 1080 0003 0100 0000
0062040  a410 2000 a606 2030 2900 00f4 e805 23a0 e826 2038 aa06 2030 c026 2008 c026 200c c026 2010 c026 2018 c026 201c c026 2020
0062120  ac10 3fff ec26 2014 9010 0018 1080 0003 0100 0000 9010 2000 b010 0008 81c7 e008 81e8 0000 033f ffff 8200 63a0 9de3 8001
0062200  f227 a048 1100 0000 9012 2000 d207 a048 4000 cf1b 0100 0000 1300 00f4 9212 63d0 4000 cf17 0100 0000 9006 2008 1300 00f4
0062260  9212 63d2 4000 134d 0100 0000 9006 2014 1300 00f4 9212 63d9 4000 1348 0100 0000 9006 2020 1300 00f4 9212 63e7 4000 1343
0062340  0100 0000 9010 2000 b010 0008 81c7 e008 81e8 0000 033f ffff 8200 6370 9de3 8001 d006 200c d027 bffc d207 bffc 8090 0009
0062420  0280 00c3 0100 0000 d007 bffc d202 2008 d227 bff4 d407 bff4 9602 a01c d627 bff0 9006 2014 d807 bff0 d203 2008 4000 12c6
0062500  0100 0000 d027 bfec da07 bfec 8090 000d 0280 0009 0100 0000 d007 bfec d207 bff0 7fff fb15 0100 0000 8090 0008 1280 004c
0062560  0100 0000 9010 2000 d207 bff0 7fff fa9a 0100 0000 d027 bfec c027 bfe4 d007 bfe4 8090 0008 1280 0009 0100 0000 9010 200c
0062640  4000 cebf 0100 0000 d027 bfe4 8090 0008 0280 0034 0100 0000 d207 bfe4 d227 bfe0 c027 bfdc d407 bfe0 8090 000a 1280 0009
0062720  0100 0000 9010 2008 4000 ceb1 0100 0000 d027 bfe0 8090 0008 0280 001a 0100 0000 d607 bfe0 8090 000b 1280 0008 0100 0000
0063000  9010 2004 4000 cea6 0100 0000 8090 0008 0280 0008 0100 0000 d807 bfe0 1b00 00f4 da03 63cc da23 0000 1080 0003 0100 0000
0063060  9a10 2000 de07 bfe0 de27 bfe0 e007 bfe0 e207 bfdc e224 2004 1080 0003 0100 0000 a210 2000 e407 bfe0 e427 bfe4 e607 bfe4
0063140  2900 00f4 e805 23c8 e824 c000 ea07 bfe4 ec07 bfec ec25 6008 1080 0003 0100 0000 ac10 2000 ee07 bfe4 ee27 bff8 9006 2014
0063220  d207 bff8 4000 1086 0100 0000 d007 bff4 7fff f421 0100 0000 8090 0008 0280 0007 0100 0000 f207 bfec b406 601c f427 bfe8
0063300  1080 0005 0100 0000 f607 bfec b806 e028 f827 bfe8 c027 bfe4 fa07 bfe4 8090 001d 1280 0009 0100 0000 9010 200c 4000 ce6c
0063360  0100 0000 d027 bfe4 8090 0008 0280 0034 0100 0000 d007 bfe4 d027 bfe0 c027 bfdc d207 bfe0 8090 0009 1280 0009 0100 0000
```

```
0063440  9010 2008 4000 ce5e 0100 0000 d027 bfe0 8090 0008 0280 001a 0100 0000 d407 bfe0 8090 000a 1280 0008 0100 0000 9010 2004
0063520  4000 ce53 0100 0000 8090 0008 0280 0008 0100 0000 d607 bfe0 1900 00f4 d803 23cc d822 c000 1080 0003 0100 0000 9810 2000
0063600  da07 bfe0 da27 bfe0 de07 bfe0 e007 bfdc e023 e004 1080 0003 0100 0000 a010 2000 e207 bfe0 e227 bfe4 e407 bfe4 2700 00f4
0063660  e604 e3c8 e624 8000 e807 bfe4 ea07 bff4 ea25 2008 1080 0003 0100 0000 aa10 2000 ec07 bfe4 ec27 bff8 d007 bfe8 d207 bff8
0063740  4000 1033 0100 0000 ee07 bffc f205 e004 9090 0019 0280 0006 0100 0000 f407 bffc f606 a004 1080 0003 0100 0000 b610 2000
0064020  f627 bffc 10bf ff3d 0100 0000 9006 2014 d027 bfd4 d206 2018 d227 bfd8 9427 a02c d607 bfd8 d627 bffc 8090 000b 0280 0027
0064100  0100 0000 d007 bffc d202 2008 d227 bfec d007 bfec 9002 201c 9210 2001 4000 129a 0100 0000 d007 bfec 9002 2028 9210 2001
0064160  4000 1295 0100 0000 d407 bfd8 8090 000a 0280 0013 0100 0000 d607 bfd8 d802 e004 8090 000c 0280 0006 0100 0000 da07 bfd8
0064240  de03 6004 1080 0003 0100 0000 9e10 2000 de27 bfd8 8090 000f 0280 0005 0100 0000 a010 2001 1080 0003 0100 0000 a010 2000
0064320  10bf ffd8 0100 0000 9010 2000 b010 0008 81c7 e008 81e8 0000 033f ffff 8200 63a0 9de3 8001 f027 a044 f227 a048 d007 a044
0064400  8090 0008 1280 0009 0100 0000 9010 2018 4000 cde3 0100 0000 d027 a044 8090 0008 0280 002e 0100 0000 d007 a044 9210 2000
0064460  4000 0ded 0100 0000 d027 a044 d007 a044 1300 00f4 d202 638c d222 0000 d407 a044 9602 a00c 8090 000b 1280 0008 0100 0000
0064540  9010 200c 4000 cdce 0100 0000 8090 0008 0280 000d 0100 0000 d807 a044 1b00 00f4 da03 63a4 da23 2014 de07 a044 c023 e010
0064620  e007 a044 c024 200c a210 2000 1080 0003 0100 0000 a210 2000 e407 a044 a604 a00c e807 a044 2b00 00f4 ea05 63a0 ea25 2014
0064700  ec07 a044 ae05 a00c d007 a044 d207 a048 4000 c15c 0100 0000 d007 a044 1080 0003 0100 0000 9010 2000 b010 0008 81c7 e008
0064760  81e8 0000 033f ffff 8200 6378 9de3 8001 d006 2018 d027 bffc d207 bffc 8090 0009 0280 00ad 0100 0000 d007 bffc d202 2008
0065040  d227 bff4 9006 2020 d407 bff4 d202 a00c 4000 1189 0100 0000 d027 bff0 d607 bff0 8090 000b 1280 004d 0100 0000 d007 bff4
0065120  d202 200c 9010 2000 7fff ffa4 0100 0000 d027 bff0 c027 bfec d207 bfec 8090 0009 1280 0009 0100 0000 9010 200c 4000 cd88
0065200  0100 0000 d027 bfec 8090 0008 0280 0034 0100 0000 d407 bfec d427 bfe8 c027 bfe4 d607 bfe8 8090 000b 1280 0009 0100 0000
0065260  9010 2008 4000 cd7a 0100 0000 d027 bfe8 8090 0008 0280 001a 0100 0000 d807 bfe8 8090 000c 1280 0008 0100 0000 9010 2004
0065340  4000 cd6f 0100 0000 8090 0008 0280 0008 0100 0000 da07 bfe8 1f00 00f4 de03 e3cc de23 4000 1080 0003 0100 0000 9e10 2000
0065420  e007 bfe8 e027 bfe8 e207 bfe8 e407 bfe4 e424 6004 1080 0003 0100 0000 a410 2000 e607 bfe8 e627 bfec e807 bfec 2b00 00f4
0065500  ea05 63c8 ea25 0000 ec07 bfec ee07 bff0 ee25 a008 1080 0003 0100 0000 ae10 2000 f207 bfec f227 bff8 9006 2020 d207 bff8
0065560  4000 0f4f 0100 0000 c027 bfec f407 bfec 8090 001a 1280 0009 0100 0000 9010 200c 4000 cd43 0100 0000 d027 bfec 8090 0008
0065640  0280 0034 0100 0000 f607 bfec f627 bfe8 c027 bfe4 f807 bfe8 8090 001c 1280 0009 0100 0000 9010 2008 4000 cd35 0100 0000
0065720  d027 bfe8 8090 0008 0280 001a 0100 0000 fa07 bfe8 8090 001d 1280 0008 0100 0000 9010 2004 4000 cd2a 0100 0000 8090 0008
0066000  0280 0008 0100 0000 d007 bfe8 1300 00f4 d202 63cc d222 0000 1080 0003 0100 0000 9210 2000 d407 bfe8 d427 bfe8 d607 bfe8
0066060  d807 bfe4 d822 e004 1080 0003 0100 0000 9810 2000 da07 bfe8 da27 bfec de07 bfec 2100 00f4 e004 23c8 e023 c000 e207 bfec
0066140  e407 bff4 e424 6008 1080 0003 0100 0000 a410 2000 e607 bfec e627 bff8 d007 bff0 9002 200c d207 bff8 4000 0f09 0100 0000
0066220  e807 bffc ea05 2004 8090 0015 0280 0006 0100 0000 ec07 bffc ee05 a004 1080 0003 0100 0000 ae10 2000 ee27 bffc 10bf ff53
0066300  0100 0000 9006 2020 d027 bfdc d206 2024 d227 bfe0 9427 a024 d607 bfdc 8090 000b 0280 0007 0100 0000 d807 bfdc da03 2004
0066360  da27 bfe0 1080 0003 0100 0000 9a10 2000 de07 bfe0 de27 bffc 8090 000f 0280 0022 0100 0000 d007 bffc d202 2008 d227 bff0
0066440  d007 bff0 9002 200c 9210 2001 4000 1166 0100 0000 d407 bfe0 8090 000a 0280 0013 0100 0000 d607 bfe0 d802 e004 8090 000c
0066520  0280 0006 0100 0000 da07 bfe0 de03 6004 1080 0003 0100 0000 9e10 2000 de27 bfe0 8090 000f 0280 0005 0100 0000 a010 2001
0066600  1080 0003 0100 0000 a010 2000 10bf ffdd 0100 0000 9010 2000 b010 0008 81c7 e008 81e8 0000 033f ffff 8200 6398 9de3 8001
0066660  d006 200c d027 bffc d207 bffc 8090 0009 0280 0025 0100 0000 d007 bffc d202 2008 d227 bff8 d007 bff8 9002 205c 4000 1267
0066740  0100 0000 d007 bff8 9002 2068 4000 1263 0100 0000 d007 bff8 9002 2074 4000 125f 0100 0000 d007 bff8 9002 2080 4000 125b
0067020  0100 0000 d007 bff8 7fff f3ff 0100 0000 d407 bffc d602 a004 8090 000b 0280 0006 0100 0000 d807 bffc da03 2004 1080 0003
0067100  0100 0000 9a10 2000 da27 bffc 10bf ffdb 0100 0000 9010 2000 b010 0008 81c7 e008 81e8 0000 033f ffff 8200 6398 9de3 8001
0067160  d006 2024 d027 bffc d207 bffc 8090 0009 0280 0015 0100 0000 d007 bffc d202 2008 d227 bff8 d007 bff8 7fff fbd2 0100 0000
0067240  d407 bffc d602 a004 8090 000b 0280 0006 0100 0000 d807 bffc da03 2004 1080 0003 0100 0000 9a10 2000 da27 bffc 10bf ffeb
0067320  0100 0000 9010 2000 b010 0008 81c7 e008 81e8 0000 033f ffff 8200 63a0 9de3 8001 1100 0124 9012 22b8 4000 cc7b 0100 0000
0067400  9010 2000 b010 0008 81c7 e008 81e8 0000 033f ffff 8200 63a0 9de3 8001 1100 0124 9012 22b8 9210 2002 4000 cc72 0100 0000
0067460  9010 2000 b010 0008 81c7 e008 81e8 0000 033f ffff 8200 63a0 9de3 8001 f227 a048 d007 a048 4000 09b6 0100 0000 d026 2008
0067540  9010 0018 d206 2008 4000 0ca3 0100 0000 9010 2000 b010 0008 81c7 e008 81e8 0000 033f ffff 8200 63a0 9de3 8001 f227 a048
0067620  1100 0000 9012 2000 d207 a048 4000 cc58 0100 0000 1300 00f4 9212 63f4 4000 cc54 0100 0000 d006 2008 d202 0000 c202 600c
0067700  d406 2008 d602 8000 d852 e008 9a10 000c d006 2008 9002 000d 1300 00f4 9212 63f6 9fc0 4000 0100 0000 9010 2000 b010 0008
0067760  81c7 e008 81e8 0000 033f ffff 8200 63c0 9de3 8001 f027 a044 f227 a048 9010 3fff 1080 0003 0100 0000 9010 2000 b010 0008
*
0070120  81c7 e008 81e8 0000 033f ffff 8200 63c0 9de3 8001 f027 a044 f227 a048 f427 a04c f627 a050 9010 2000 b010 0008 81c7 e008
0070200  81e8 0000 033f ffff 8200 63c0 9de3 8001 f027 a044 f227 a048 f427 a04c 9010 2000 b010 0008 81c7 e008 81e8 0000 033f ffff
0070260  8200 63c0 9de3 8001 f027 a044 f227 a048 f427 a04c 9010 2000 b010 0008 81c7 e008 81e8 0000 033f ffff 8200 63c0 9de3 8001
0070340  f027 a044 f227 a048 f427 a04c 9010 2000 1080 0003 0100 0000 9010 2000 b010 0008 81c7 e008 81e8 0000 033f ffff 8200 63c0
0070420  9de3 8001 f027 a044 f227 a048 9010 2000 1080 0003 0100 0000 9010 2000 b010 0008 81c7 e008 81e8 0000 033f ffff 8200 63c0
0070500  9de3 8001 f027 a044 f227 a048 9010 3fff 1080 0003 0100 0000 9010 2000 b010 0008 81c7 e008 81e8 0000 033f ffff 8200 63a0
```

```
0070560  9de3 8001 f22f a04b d006 2004 d202 2014 8090 0009 0280 000a 0100 0000 9010 0018 4000 cbbd 0100 0000 8090 0008 1280 0004
0070640  0100 0000 1080 0043 0100 0000 d006 2004 d202 2008 d402 6010 d606 2004 d802 e008 da03 200c 80a3 400a 0a80 0014 0100 0000
0070720  de06 2004 e003 e008 e204 2024 c204 6014 e406 2004 e604 a008 e804 e024 ea55 2010 ac10 0015 ee06 2004 d005 e008 9002 0016
0071000  d24f a04b 920a 60ff 9fc0 4000 0100 0000 1080 000d 0100 0000 f206 2004 f406 6008 f606 a00c b606 e001 f626 a00c b826 e001
0071060  d04f a04b 912a 2018 913a 2018 d02f 0000 900a 20ff 80a2 3fff 1280 000e 0100 0000 d006 2004 d202 200c 9212 6003 d222 200c
0071140  d406 2004 d602 a010 9612 e003 d622 a010 d806 2004 da03 2010 9a13 6003 da23 2010 de06 2004 e003 e01c 8090 0010 0280 0008
0071220  0100 0000 9010 0018 4000 cb7e 0100 0000 a210 2000 1080 0003 0100 0000 a210 2000 9010 0018 1080 0003 0100 0000 9010 2000
0071300  b010 0008 81c7 e008 81e8 0000 033f ffff 8200 63a0 9de3 8001 8090 0018 1280 0009 0100 0000 9010 203c 4000 cb6d 0100 0000
0071360  b010 0008 8090 0008 0280 0042 0100 0000 9010 0018 9210 2000 4000 0b77 0100 0000 b010 0008 1100 00f5 d002 20f0 d026 0000
0071440  9206 2024 8090 0009 1280 0008 0100 0000 9010 200c 4000 cb5a 0100 0000 8090 0008 0280 000a 0100 0000 1500 00f5 d402 a160
0071520  d426 202c c026 2028 c026 2024 9610 2000 1080 0003 0100 0000 9610 2000 9806 2024 1b00 00f5 da03 615c da26 202c 9e06 2024
0071600  a006 2030 8090 0010 1280 0008 0100 0000 9010 200c 4000 cb42 0100 0000 8090 0008 0280 000a 0100 0000 2300 00f5 e204 6160
0071660  e226 2038 c026 2034 c026 2030 a410 2000 1080 0003 0100 0000 a410 2000 a606 2030 2900 00f5 e805 215c e826 2038 aa06 2030
0071740  c026 2008 c026 200c c026 2010 c026 2018 c026 201c c026 2020 ac10 3fff ec26 2014 9010 0018 1080 0003 0100 0000 9010 2000
0072020  b010 0008 81c7 e008 81e8 0000 033f ffff 8200 63a0 9de3 8001 8090 0018 1280 0009 0100 0000 9010 208c 4000 cb19 0100 0000
0072100  b010 0008 8090 0008 0280 0070 0100 0000 9010 0018 9210 2000 4000 0b23 0100 0000 b010 0008 1100 00f5 d002 20ec d026 0000
0072160  9006 201c 7fff ff96 0100 0000 9206 205c 9090 0009 1280 0008 0100 0000 9010 200c 4000 cb03 0100 0000 8090 0008 0280 000a
0072240  0100 0000 1500 00f5 d402 a160 d426 2064 c026 2060 c026 205c 9610 2000 1080 0003 0100 0000 9610 2000 9806 205c 1b00 00f5
0072320  da03 615c da26 2064 9e06 205c a006 2068 8090 0010 1280 0008 0100 0000 9010 200c 4000 caeb 0100 0000 8090 0008 0280 000a
0072400  0100 0000 2300 00f5 e204 6160 e226 2070 c026 206c c026 2068 a410 2000 1080 0003 0100 0000 a410 2000 a606 2068 2900 00f5
0072460  e805 215c e826 2070 aa06 2068 ac06 2074 9090 0016 1280 0008 0100 0000 9010 200c 4000 cad3 0100 0000 8090 0008 0280 000a
0072540  0100 0000 2f00 00f5 ee05 e160 ee26 207c c026 2078 c026 2074 b210 2000 1080 0003 0100 0000 b210 2000 b406 2074 3700 00f5
0072620  f606 e15c f626 207c b806 2074 ba06 2080 9090 001d 1280 0008 0100 0000 9010 200c 4000 cabb 0100 0000 8090 0008 0280 000a
0072700  0100 0000 1100 00f5 d002 2160 d026 2088 c026 2084 c026 2080 9210 2000 1080 0003 0100 0000 9210 2000 9406 2080 1700 00f5
0072760  d602 e15c d626 2088 9806 2080 c026 2098 c026 200c c026 2058 9010 0018 1080 0003 0100 0000 9010 2000 b010 0008 81c7 e008
0073040  81e8 0000 033f ffff 8200 63a0 9de3 8001 f227 a048 8090 0018 1280 0009 0100 0000 9010 201c 4000 ca96 0100 0000 b010 0008
0073120  8090 0008 0280 001b 0100 0000 9010 0018 9210 2000 4000 0aa0 0100 0000 b010 0008 1100 00f5 d002 214c d026 0000 9006 200c
0073200  9210 2000 4000 0a98 0100 0000 1300 00f5 d202 6154 d226 200c c026 2014 9406 200c d007 a048 4000 07e2 0100 0000 d026 2008
0073260  9010 0018 d206 2008 4000 0acf 0100 0000 9010 0018 1080 0003 0100 0000 9010 2000 b010 0008 81c7 e008 81e8 0000 033f ffff
0073340  8200 63a0 9de3 8001 8090 0018 1280 0009 0100 0000 9010 203c 4000 ca69 0100 0000 b010 0008 8090 0008 0280 001b 0100 0000
0073420  9010 0018 9210 2000 4000 0a73 0100 0000 b010 0008 1100 00f5 d002 2150 d026 0000 9006 202c 9210 2000 4000 0a6b 0100 0000
0073500  1300 00f5 d202 6154 d226 202c c026 2034 9406 202c c026 2008 c026 200c c026 2010 c026 2028 c026 2020 c026 2014 c026 2018
0073560  c026 201c 9010 0018 1080 0003 0100 0000 9010 2000 b010 0008 81c7 e008 81e8 0000 033f ffff 8200 6308 9de3 8001 f227 a048
0073640  c027 bff8 c027 bff4 c027 bff0 c027 bfec 9010 3fff d027 bfe8 9210 3fff d227 bfe4 c027 bfe0 d007 a048 1300 00f5 9212 6190
0073720  4000 ca36 0100 0000 d027 bfdc d407 bfdc 8090 000a 1280 000a 0100 0000 1100 0007 9012 2341 9210 2053 1500 00f5 9412 a192
0074000  d607 a048 4000 1f0a 0100 0000 1100 00f5 9012 21af d207 a048 4000 ca51 0100 0000 4000 92e2 0100 0000 d027 bfd0 9610 2001
0074060  d623 a05c d007 bfd0 1300 00f5 9212 61cb 9410 2004 9610 3fff 9810 2002 9a10 2003 4000 5e34 0100 0000 1900 00f5 d023 20dc
0074140  1100 00f5 d002 20dc 1300 00f5 9212 60d8 4000 645f 0100 0000 1100 00f5 d002 20dc 1300 00f5 9212 61cc 9410 2005 4000 5fe6
0074220  0100 0000 1100 00f5 d002 20dc 1300 00f5 9212 61ce 9410 2006 4000 5fdf 0100 0000 1100 00f5 d002 20dc 1300 00f5 9212 61d0
0074300  9410 2007 4000 5fd8 0100 0000 1100 00f5 d002 20dc 1300 00f5 9212 61d2 9410 2008 4000 5fd1 0100 0000 1100 00f5 d002 20dc
0074360  1300 00f5 9212 61d4 9410 2009 4000 5fca 0100 0000 1100 00f5 d002 20dc 1300 00f5 9212 61d6 9410 200b 4000 5fc3 0100 0000
0074440  1100 00f5 d002 20dc 1300 00f5 9212 61d8 9410 200a 4000 5fbc 0100 0000 1100 00f5 d002 20dc 1300 00f5 9212 61da 9410 200d
0074520  4000 5fb5 0100 0000 1100 00f5 d002 20dc 1300 00f5 9212 61dc 9410 200c 4000 5fae 0100 0000 1100 00f5 d002 20dc 1300 00f5
0074600  9212 61de 9410 200e 4000 5fa7 0100 0000 1100 00f5 d002 20dc 1300 00f5 9212 61e8 9410 200f 4000 5fa0 0100 0000 1100 00f5
0074660  d002 20dc 1300 00f5 9212 61ed 9410 2010 4000 5f99 0100 0000 1100 00f5 d002 20dc 1300 00f5 9212 61f8 9410 2011 4000 5f92
0074740  0100 0000 1100 00f5 d002 20dc 1300 00f5 9212 61fc 9410 2012 4000 5f8b 0100 0000 1100 00f5 d002 20dc 1300 00f5 9212 6202
0075020  9410 2013 4000 5f84 0100 0000 1100 00f5 1002 20dc 1300 00f5 9212 6211 9410 201d 4000 5f7d 0100 0000 1100 00f5 d002 20dc
0075100  1300 00f5 9212 6218 9410 201e 4000 5f76 0100 0000 1100 00f5 d002 20dc 1300 00f5 9212 6225 9410 201f 4000 5f6f 0100 0000
0075160  1100 00f5 d002 20dc 1300 00f5 9212 6231 9410 201a 4000 5f68 0100 0000 1100 00f5 d002 20dc 1300 00f5 9212 6236 9410 201b
0075240  4000 5f61 0100 0000 1100 00f5 d002 20dc 1300 00f5 9212 6240 9410 201c 4000 5f5a 0100 0000 1100 00f5 d002 20dc 1300 00f5
0075320  9212 624a 9410 2020 4000 5f53 0100 0000 1100 00f5 d002 20dc 1300 00f5 9212 6257 9410 2014 4000 5f4c 0100 0000 1100 00f5
0075400  d002 20dc 1300 00f5 9212 6261 9410 2015 4000 5f45 0100 0000 1100 00f5 d002 20dc 1300 00f5 9212 626b 9410 2016 4000 5f3e
0075460  0100 0000 1100 00f5 d002 20dc 1300 00f5 9212 6275 9410 2017 4000 5f37 0100 0000 1100 00f5 d002 20dc 1300 00f5 9212 627c
0075540  9410 2018 4000 5f30 0100 0000 1100 00f5 d002 20dc 1300 00f5 9212 6283 9410 2019 4000 5f29 0100 0000 1100 00f5 d002 20dc
0075620  1300 00f5 9212 628c 9410 2021 4000 5f22 0100 0000 1100 00f5 d002 20dc 1300 00f5 9212 6299 9410 2022 4000 5f1b 0100 0000
```

| | | | | | | | | | | | | | | | | | | | | | | | | |
|---|---|---|---|---|---|---|---|---|---|---|---|---|---|---|---|---|---|---|---|---|---|---|---|---|
| 0075700 | 1100 | 00f5 | d002 | 20dc | 1300 | 00f5 | 9212 | 629f | 9410 | 2002 | 4000 | 5edf | 0100 | 0000 | 1100 | 00f5 | d002 | 20dc | 1300 | 008e | 9212 | 6154 | d407 | bfdc |
| 0075760 | 4000 | 6075 | 0100 | 0000 | 1100 | 00f5 | d002 | 20dc | 4000 | 6500 | 0100 | 0000 | d027 | bffc | 80a2 | 3fff | 0280 | 0383 | 0100 | 0000 | 1080 | 0353 | 0100 | 0000 |
| 0076040 | d007 | bfec | 8090 | 0008 | 1280 | 005a | 0100 | 0000 | 1300 | 00f5 | d202 | 60c4 | 8090 | 0009 | 1280 | 0055 | 0100 | 0000 | 9010 | 2000 | 7fff | fdf5 | 0100 | 0000 |
| 0076120 | 1300 | 00f5 | d022 | 60c4 | c027 | bfcc | 1500 | 00f5 | d402 | a0c4 | d427 | bfc8 | d607 | bfcc | 8090 | 000b | 1280 | 0009 | 0100 | 0000 | 9010 | 200c | 4000 | c908 |
| 0076200 | 0100 | 0000 | d027 | bfcc | 8090 | 0008 | 0280 | 0034 | 0100 | 0000 | d807 | bfcc | d827 | bfc4 | c027 | bfc0 | da07 | bfc4 | 8090 | 000d | 1280 | 0009 | 0100 | 0000 |
| 0076260 | 9010 | 2008 | 4000 | c8fa | 0100 | 0000 | d027 | bfc4 | 8090 | 0008 | 0280 | 001a | 0100 | 0000 | de07 | bfc4 | 8090 | 000f | 1280 | 0008 | 0100 | 0000 | 9010 | 2004 |
| 0076340 | 4000 | c8ef | 0100 | 0000 | 8090 | 0008 | 0280 | 0008 | 0100 | 0000 | e007 | bfc4 | 2300 | 00f5 | e204 | 6188 | e224 | 0000 | 1080 | 0003 | 0100 | 0000 | a210 | 2000 |
| 0076420 | e407 | bfc4 | e427 | bfc4 | e607 | bfc4 | e807 | bfc0 | e824 | e004 | 1080 | 0003 | 0100 | 0000 | a810 | 2000 | ea07 | bfc4 | ea27 | bfcc | ec07 | bfcc | 2f00 | 00f5 |
| 0076500 | ee05 | e184 | ee25 | 8000 | d007 | bfcc | d207 | bfc8 | d222 | 2008 | 1080 | 0003 | 0100 | 0000 | 9210 | 2000 | d407 | bfcc | d427 | bfd8 | 9606 | 2008 | 1900 | 00f5 |
| 0076560 | d623 | 20c0 | 1100 | 00f5 | d002 | 20c0 | d207 | bfd8 | 4000 | 0acb | 0100 | 0000 | 1080 | 000a | 0100 | 0000 | 1100 | 0008 | 9012 | 2329 | 1300 | 00f5 | d202 | 60d8 |
| 0076640 | 1500 | 00f5 | d402 | a0dc | 4000 | 03ed | 0100 | 0000 | da07 | bffc | da27 | bff4 | de07 | bffc | de27 | bff8 | 1080 | 0315 | 0100 | 0000 | e007 | bffc | e027 | bff8 |
| 0076720 | 1080 | 0311 | 0100 | 0000 | e207 | bfec | 80a4 | 6001 | 1280 | 0015 | 0100 | 0000 | 2500 | 00f5 | e404 | a0c4 | 8090 | 0012 | 0280 | 0010 | 0100 | 0000 | 2700 | 00f5 |
| 0077000 | e604 | e0c8 | 8090 | 0013 | 1280 | 000b | 0100 | 0000 | 1100 | 00f5 | d002 | 20c4 | d027 | bfbc | d207 | bfbc | 9402 | 601c | 1700 | 00f5 | d422 | e0c8 | 1080 | 000a |
| 0077060 | 0100 | 0000 | 1100 | 0008 | 9012 | 232a | 1300 | 00f5 | d202 | 60d8 | 1500 | 00f5 | d402 | a0dc | 4000 | 03c4 | 0100 | 0000 | d807 | bffc | d827 | bff4 | da07 | bffc |
| 0077140 | da27 | bff8 | 1080 | 02ec | 0100 | 0000 | 1f00 | 00f5 | de03 | e0c4 | de27 | bfb8 | e007 | bfb8 | a204 | 2068 | e227 | bfd4 | e407 | bffc | e427 | bff4 | e607 | bffc |
| 0077220 | e627 | bff8 | a810 | 2001 | e827 | bfe0 | 1080 | 02de | 0100 | 0000 | 2b00 | 00f5 | ea05 | 60c4 | ea27 | bfb4 | ec07 | bfb4 | ae05 | a05c | ee27 | bfd4 | d007 | bffc |
| 0077300 | d027 | bff4 | d207 | bffc | d227 | bff8 | 9410 | 2002 | d427 | bfe0 | 1080 | 02d0 | 0100 | 0000 | 1700 | 00f5 | d602 | e0c4 | d627 | bfb0 | d807 | bfb0 | 9a03 | 2074 |
| 0077360 | da27 | bff4 | de07 | bffc | de27 | bff4 | e007 | bffc | e027 | bff8 | a210 | 2003 | e227 | bfe0 | 1080 | 02c2 | 0100 | 0000 | 1080 | 02c0 | 0100 | 0000 | e407 | bfec |
| 0077440 | a424 | a001 | e427 | bfec | e607 | bfec | 80a4 | e001 | 1280 | 000d | 0100 | 0000 | c027 | bfd4 | 1100 | 00f5 | c022 | 20c8 | 1300 | 00f5 | c022 | 60cc | 1500 | 00f5 |
| 0077520 | c022 | a0d0 | 9610 | 200e | d627 | bff4 | 1080 | 0012 | 0100 | 0000 | d807 | bfec | 80a3 | 2002 | 1280 | 0008 | 0100 | 0000 | 1100 | 00f5 | c022 | 20d0 | 1300 | 00f5 |
| 0077600 | c022 | 60cc | 1080 | 0008 | 0100 | 0000 | d407 | bfec | 8090 | 000a | 1280 | 0004 | 0100 | 0000 | 1100 | 00f5 | c022 | 20c4 | 1080 | 029c | 0100 | 0000 | d207 | bfec |
| 0077660 | 9202 | 6001 | d227 | bfec | 1080 | 0297 | 0100 | 0000 | d407 | bffc | d427 | bff4 | d607 | bffc | d627 | bff8 | 1080 | 0291 | 0100 | 0000 | 1080 | 01f8 | 0100 | 0000 |
| 0077740 | 1100 | 00f5 | fa02 | 20c4 | 1300 | 00f5 | d202 | 60dc | d227 | bfac | d007 | bfac | 4000 | 058d | 0100 | 0000 | d027 | 6008 | 9010 | 001d | d207 | 6008 | 4000 | 087a |
| 0100020 | 0100 | 0000 | 1080 | 0208 | 0100 | 0000 | d407 | bff4 | d427 | bfe8 | d007 | bfe8 | 1300 | 00f5 | d202 | 60dc | 4000 | 0300 | 0100 | 0000 | 9610 | 3fff | d627 | bfe8 |
| 0100100 | 1080 | 01fd | 0100 | 0000 | d807 | bff4 | d827 | bfe4 | d007 | bfe4 | 9210 | 2001 | 1500 | 00f5 | d402 | a0dc | 4000 | 0280 | 0100 | 0000 | 9a10 | 3fff | da27 | bfe4 |
| 0100160 | 1080 | 01f1 | 0100 | 0000 | de07 | bfec | 80a3 | e002 | 1280 | 006b | 0100 | 0000 | 2100 | 00f5 | e004 | 20c4 | 8090 | 0010 | 0280 | 0066 | 0100 | 0000 | 2300 | 00f5 |
| 0100240 | e204 | 60cc | 8090 | 0011 | 1280 | 0061 | 0100 | 0000 | 9010 | 2000 | 1300 | 00f5 | d202 | 60dc | 7fff | fd5a | 0100 | 0000 | 1300 | 00f5 | d022 | 60cc | 1100 | 00f5 |
| 0100320 | d002 | 20cc | 1300 | 00f5 | d202 | 60dc | 4000 | 0846 | 0100 | 0000 | c027 | bfcc | 1500 | 00f5 | d402 | a0cc | d427 | bfc8 | d607 | bfcc | 8090 | 000b | 1280 | 0009 |
| 0100400 | 0100 | 0000 | 9010 | 200c | 4000 | c7e5 | 0100 | 0000 | d027 | bfcc | 8090 | 0008 | 0280 | 0034 | 0100 | 0000 | d807 | bfcc | d827 | bfc4 | c027 | bfc0 | da07 | bfc4 |
| 0100460 | 8090 | 000d | 1280 | 0009 | 0100 | 0000 | 9010 | 2008 | 4000 | c717 | 0100 | 0000 | d027 | bfc4 | 8090 | 0008 | 0280 | 001a | 0100 | 0000 | de07 | bfc4 | 8090 | 000f |
| 0100540 | 1280 | 0008 | 0100 | 0000 | 9010 | 2004 | 4000 | c7cc | 0100 | 0000 | 8090 | 0008 | 0280 | 0008 | 0100 | 0000 | e007 | bfc4 | 2300 | 00f5 | e204 | 6188 | e224 | 0000 |
| 0100620 | 1080 | 0003 | 0100 | 0000 | a210 | 2000 | e407 | bfc4 | e427 | bfc4 | e607 | bfc4 | e807 | bfc0 | e824 | e004 | 1080 | 0003 | 0100 | 0000 | a810 | 2000 | ea07 | bfc4 |
| 0100700 | ea27 | bfcc | ec07 | bfcc | 2f00 | 00f5 | ee05 | e184 | ee25 | 8000 | d007 | bfcc | d207 | bfc8 | d222 | 2008 | 1080 | 0003 | 0100 | 0000 | 9210 | 2000 | d407 | bfcc |
| 0100760 | d427 | bfd8 | 1700 | 00f5 | d602 | e0c4 | d627 | bfa8 | d807 | bfa8 | 9a03 | 2080 | 1f00 | 00f5 | da23 | e0c0 | 1100 | 00f5 | d002 | 20c0 | d207 | bfd8 | 4000 | 09a4 |
| 0101040 | 0100 | 0000 | 1080 | 000a | 0100 | 0000 | 1100 | 0008 | 9012 | 232b | 1300 | 00f5 | d202 | 60d8 | 1500 | 00f5 | d402 | a0dc | 4000 | 02c6 | 0100 | 0000 | 1080 | 017a |
| 0101120 | 0100 | 0000 | 2100 | 00f5 | f804 | 20c8 | 2300 | 00f5 | e204 | 60dc | e227 | bfa4 | d007 | bfa4 | 4000 | 04f0 | 0100 | 0000 | d027 | 2008 | 9010 | 001c | d207 | 2008 |
| 0101200 | 4000 | 07dd | 0100 | 0000 | 1080 | 016b | 0100 | 0000 | 2500 | 00f5 | e404 | a0c8 | e427 | bfa0 | 2700 | 00f5 | e604 | e0dc | e627 | bf9c | d007 | bf9c | 4000 | 04e0 |
| 0101260 | 0100 | 0000 | e807 | bfa0 | d025 | 2010 | 1080 | 015e | 0100 | 0000 | 1100 | 00f5 | d002 | 20dc | 4000 | 0625 | 0100 | 0000 | 9210 | 0008 | 1100 | 00f5 | d002 | 20c8 |
| 0101340 | 7fff | e965 | 0100 | 0000 | 1080 | 0153 | 0100 | 0000 | 2b00 | 00f5 | ea05 | 60c8 | ea27 | bf98 | 2d00 | 00f5 | ec05 | a0dc | ec27 | bf94 | d007 | bf94 | 4000 | 04c8 |
| 0101420 | 0100 | 0000 | ee07 | bf98 | d025 | e00c | 1080 | 0146 | 0100 | 0000 | d007 | bfec | 80a2 | 2002 | 1280 | 006d | 0100 | 0000 | 1300 | 00f5 | d202 | 60c4 | 8090 | 0009 |
| 0101500 | 0280 | 0068 | 0100 | 0000 | d407 | bfd4 | 8090 | 000a | 0280 | 0064 | 0100 | 0000 | 9010 | 2000 | 7fff | fce0 | 0100 | 0000 | 1300 | 00f5 | d022 | 60d0 | c027 | bfcc |
| 0101560 | 1500 | 00f5 | d402 | a0d0 | d427 | bfc8 | d607 | bfcc | 8090 | 000b | 1280 | 0009 | 0100 | 0000 | 9010 | 200c | 4000 | c743 | 0100 | 0000 | d027 | bfcc | 8090 | 0008 |
| 0101640 | 0280 | 0034 | 0100 | 0000 | d807 | bfcc | d827 | bfc4 | c027 | bfc0 | da07 | bfc4 | 8090 | 000d | 1280 | 0009 | 0100 | 0000 | 9010 | 2008 | 4000 | c735 | 0100 | 0000 |
| 0101720 | d027 | bfc4 | 8090 | 0008 | 0280 | 001a | 0100 | 0000 | de07 | bfc4 | 8090 | 000f | 1280 | 0008 | 0100 | 0000 | 9010 | 2004 | 4000 | c72a | 0100 | 0000 | 8090 | 0008 |
| 0102000 | 0280 | 0008 | 0100 | 0000 | e007 | bfc4 | 2300 | 00f5 | e204 | 6188 | e224 | 0000 | 1080 | 0003 | 0100 | 0000 | a210 | 2000 | e407 | bfc4 | e427 | bfc4 | e607 | bfc4 |
| 0102060 | e807 | bfc0 | e824 | e004 | 1080 | 0003 | 0100 | 0000 | a810 | 2000 | ea07 | bfc4 | ea27 | bfcc | ec07 | bfcc | 2f00 | 00f5 | ee05 | e184 | ee25 | 8000 | d007 | bfcc |
| 0102140 | d207 | bfc8 | d222 | 2008 | 1080 | 0003 | 0100 | 0000 | 9210 | 2000 | d407 | bfcc | d427 | bfd8 | d007 | bfd4 | d207 | bfd8 | 4000 | 090a | 0100 | 0000 | 1700 | 00f5 |
| 0102220 | f602 | e0d0 | 1900 | 00f5 | d803 | 20dc | d827 | bf90 | d007 | bf90 | 4000 | 0462 | 0100 | 0000 | dc26 | e008 | 9010 | 001b | d206 | e008 | 4000 | 074f | 0100 | 0000 |
| 0102300 | 1b00 | 00f5 | da03 | 60d0 | da27 | bf8c | de07 | bf8c | e007 | bfe0 | e023 | e020 | 1080 | 000a | 0100 | 0000 | 1100 | 0008 | 9012 | 232c | 1300 | 00f5 | d202 | 60d8 |
| 0102360 | 1500 | 00f5 | d402 | a0dc | 4000 | 0219 | 0100 | 0000 | 1080 | 00cd | 0100 | 0000 | e207 | bfec | 80a4 | 6003 | 1280 | 0015 | 0100 | 0000 | e407 | bfd4 | 8090 | 0012 |
| 0102440 | 0280 | 0011 | 0100 | 0000 | 2700 | 00f5 | f404 | e0d0 | 2900 | 00f5 | e905 | 20dc | e827 | bf88 | d007 | bf88 | 4000 | 043b | 0100 | 0000 | d026 | a010 | 9010 | 001a |
| 0102520 | d206 | a010 | 7fff | e5b6 | 0100 | 0000 | 1080 | 000a | 0100 | 0000 | 1100 | 0008 | 9012 | 232d | 1300 | 00f5 | d202 | 60d8 | 1500 | 00f5 | d402 | a0dc | 4000 | 01f8 |
| 0102600 | 0100 | 0000 | 1080 | 00ac | 0100 | 0000 | ea07 | bfec | 80a5 | 6003 | 1280 | 0011 | 0100 | 0000 | ec07 | bfd4 | 809c | 0016 | 0280 | 000d | 0100 | 0000 | 1100 | 00f5 |
| 0102660 | d002 | 20dc | 4000 | 056b | 0100 | 0000 | 9210 | 0008 | 1100 | 00f5 | d002 | 20d0 | 7fff | e42c | 0100 | 0000 | 1080 | 000a | 0100 | 0000 | 1100 | 0008 | 9012 | 232e |
| 0102740 | 1300 | 00f5 | d202 | 60d8 | 1500 | 00f5 | d402 | a0dc | 4000 | 01db | 0100 | 0000 | 1080 | 008f | 0100 | 0000 | ee07 | bfec | 80a5 | e003 | 1280 | 0015 | 0100 | 0000 |

```
0103020  d007 bfd4 8090 0008 0280 0011 0100 0000 1300 00f5 f202 60d0 1500 00f5 d402 a0dc d427 bf84 d007 bf84 4000 03fd 0100 0000
0103100  d026 6014 9010 0019 d206 6014 7fff e578 0100 0000 1080 000a 0100 0000 1100 0008 9012 2336 1300 00f5 d202 60d8 1500 00f5
0103160  d402 a0dc 4000 01ba 0100 0000 1080 006e 0100 0000 d607 bfec 80a2 e003 1280 0010 0100 0000 d807 bfd4 8090 000c 0280 000c
0103240  0100 0000 1100 00f5 d002 20d0 1300 00f5 d202 60dc 1500 00f5 d402 a0c4 7fff e423 0100 0000 1080 0001 0100 0000 1100 0008
0103320  9012 2337 1300 00f5 d202 60d8 1500 00f5 d402 a0dc 4000 019e 0100 0000 1080 0052 0100 0000 1b00 00f5 da03 60c8 da27 bf80
0103400  1100 00f5 d002 20dc 4000 c68f 0100 0000 d027 bf7c de07 bf80 e007 bf7c e023 e018 1080 0045 0100 0000 2300 00f5 e204 60c8
0103460  e227 bf78 1100 00f5 d002 20dc 4000 c682 0100 0000 d027 bf74 e407 bf78 e607 bf74 e624 a01c 1080 0038 0100 0000 2900 00f5
0103540  e805 20c8 e827 bf70 1100 00f5 d002 20dc 4000 c675 0100 0000 d027 bf6c ea07 bf70 ec07 bf6c ec25 6020 1080 002b 0100 0000
0103620  1100 0008 9012 232f 1300 00f5 d202 60d8 1500 00f5 d402 a0dc 4000 016d 0100 0000 1080 0021 0100 0000 d007 bff8 9022 200e
0103700  80a2 2014 18bf fff3 912a 2002 1300 0029 9212 63e0 d002 0009 81c2 0000 0100 0000 0000 9fe0 0000 a01c 0000 a790 0000 a078
0103760  0000 a048 0000 a790 0000 a324 0000 a508 0000 a58c 0000 a790 0000 a790 0000 a790 0000 a2f0 0000 a6f4 0000 a728 0000 a254
0104040  0000 a290 0000 a2c4 0000 a75c 0000 a684 0000 a600 1080 0078 0100 0000 1080 0018 0100 0000 d007 bff4 d027 bfe4 d007 bfe4
0104120  9210 2002 1500 00f5 d402 a0dc 4000 0081 0100 0000 9210 3fff d227 bfe4 1080 0012 0100 0000 1100 0008 9012 2330 1300 00f5
0104200  d202 60d8 1500 00f5 d402 a0dc 4000 0134 0100 0000 1080 0008 0100 0000 d007 bff8 80a2 2012 02bf ffe8 0100 0000 10bf fff2
0104260  0100 0000 1080 0058 0100 0000 1080 0018 0100 0000 d007 bff4 d027 bfe4 d007 bfe4 9210 2003 1500 00f5 d402 a0dc 4000 0061
0104340  0100 0000 9210 3fff d227 bfe4 1080 0012 0100 0000 1100 0008 9012 2331 1300 00f5 d202 60d8 1500 00f5 d402 a0dc 4000 0114
0104420  0100 0000 1080 0008 0100 0000 d007 bff8 80a2 2012 02bf ffe8 0100 0000 10bf fff2 0100 0000 1080 0038 0100 0000 1100 0008
0104500  9012 2332 1300 00f5 d202 60d8 1500 00f5 d402 a0dc 4000 0102 0100 0000 1080 002e 0100 0000 d007 bffc 9022 2001 80a2 2021
0104560  18bf fff3 912a 2002 1300 002a 9212 618c d002 0009 81c2 0000 0100 0000 0000 a8bc 0000 9fd8 0000 a83c 0000 a93c 0000 9f14
0104640  0000 9f14 0000 a93c 0000 a93c 0000 a93c 0000 9f14 0000 9f14 0000 9f1c 0000 9fac 0000 9c20 0000 9fc8 0000 9dc8 0000 9fc0
0104720  0000 9fc8 0000 9dd8 0000 9fc0 0000 9fc8 0000 9fc8 0000 9e6c 0000 9ea4 0000 9edc 0000 9fc8 0000 9fc8 0000 9fc8 0000 9fc8
0105000  0000 9fc8 0000 9fc8 0000 9fc8 0000 9fc8 0000 9fc8 10bf fc79 0100 0000 1100 00f5 9012 22a1 1300 00f5 d202 60d8 4000 c5cc
0105060  0100 0000 9010 0018 7fff f8db 0100 0000 9006 2008 9210 2001 4000 0a1f 0100 0000 9010 2000 b010 0008 81c7 e008 81e8 0000
0105140  033f ffff 8200 6380 9de3 8001 f027 a044 f227 a048 f427 a04c 1080 001e 0100 0000 1100 00f5 d002 20cc d027 bffc d207 bffc
0105220  9402 600c 1700 00f5 d422 e0d4 1080 001f 0100 0000 1900 00f5 d803 20d0 d827 bff8 da07 bff8 9e03 602c 2100 00f5 de24 20d4
0105300  1080 0016 0100 0000 1100 0008 9012 2333 1300 00f5 d202 60d8 1500 00f5 d402 a0dc 4000 009f 0100 0000 1080 000c 0100 0000
0105360  d007 a044 80a2 2010 02bf ffe2 80a2 2011 02bf ffe0 80a2 2014 02bf ffe7 0100 0000 10bf ffee 0100 0000 1080 002f 0100 0000
0105440  1100 00f5 d002 20d4 d027 bff4 d007 a04c 4000 02bf 0100 0000 d207 bff4 d022 600c 1080 002f 0100 0000 1500 00f5 d402 a0d4
0105520  d427 bff0 d007 a04c 4000 c57b 0100 0000 d027 bfec d607 bff0 d807 bfec d822 e00c 1080 0023 0100 0000 1b00 00f5 da03 60d4
0105600  da27 bfe8 d007 a04c 4000 c57e 0100 0000 91a0 18c0 c127 bfe4 de07 bfe8 e007 bfe4 e023 e00c 1080 0016 0100 0000 1100 0008
0105660  9012 2334 1300 00f5 d202 60d8 1500 00f5 d402 a0dc 4000 0066 0100 0000 1080 000c 0100 0000 d007 a048 80a2 2001 02bf ffd1
0105740  80a2 2002 02bf ffd9 80a2 2003 02bf ffe3 0100 0000 10bf ffee 0100 0000 2300 00f5 e204 60d4 e227 bfe0 e407 bfe0 e607 a048
0106020  a810 0013 e824 a008 2b00 00f5 c025 6034 9010 2000 b010 0008 81c7 e008 81e8 0000 033f ffff 8200 6398 9de3 8001 f027 a044
0106100  f227 a048 1080 0031 0100 0000 d007 a048 4000 03c4 0100 0000 9210 0008 1100 00f5 d002 20c4 7fff e9dc 0100 0000 1080 0038
0106160  0100 0000 1100 00f5 fa02 20cc d007 a048 4000 03b8 0100 0000 d027 bffc 9007 600c d207 bffc 9410 2000 7fff e099 0100 0000
0106240  1080 002b 0100 0000 1300 00f5 d202 60d0 d227 bff8 d007 a048 4000 025d 0100 0000 d407 bff8 d022 a00c d007 bff8 d207 a048
0106320  4000 0075 0100 0000 1080 001d 0100 0000 1100 0008 9012 2335 1300 00f5 d202 60d8 1500 00f5 d402 a0dc 4000 0019 0100 0000
0106400  1080 0013 0100 0000 d007 a044 9022 200e 80a2 2006 18bf fff3 912a 2002 1300 002b 9212 6130 d002 0009 81c2 0000 0100 0000
0106460  0000 ac4c 0000 ace0 0000 ac74 0000 ac74 0000 ace0 0000 ace0 0000 aca8 9010 2000 b010 0008 81c7 e008 81e8 0000 033f ffff
0106540  8200 63a0 9de3 8001 f027 a044 f227 a048 f427 a04c d007 a044 9210 2053 1500 00f5 9412 a2ba d607 a048 d807 a04c 4000 19a8
0106620  0100 0000 9010 2000 b010 0008 81c7 e008 81e8 0000 033f ffff 8200 63a0 9de3 8001 1100 0124 9012 22c0 4000 c4cb 0100 0000
0106700  9010 2000 b010 0008 81c7 e008 81e8 0000 033f ffff 8200 63a0 9de3 8001 1100 0124 9012 22c0 9210 2002 4000 c4c2 0100 0000
0106760  9010 2000 b010 0008 81c7 e008 81e8 0000 033f ffff 8200 63a0 9de3 8001 f227 a048 d007 a048 4000 0206 0100 0000 d026 2008
0107040  9010 0018 d206 2008 4000 04f3 0100 0000 9010 2000 b010 0008 81c7 e008 81e8 0000 033f ffff 8200 63a0 9de3 8001 f227 a048
0107120  1100 0000 9012 2000 d207 a048 4000 c4a8 0100 0000 d206 2008 4000 c4a5 0100 0000 1300 00f5 9212 62e3 4000 c4a1 0100 0000
0107200  9006 200c 1300 00f5 9212 62e5 7fff dfc4 0100 0000 9010 2000 b010 0008 81c7 e008 81e8 0000 033f ffff 8200 63a0 9de3 8001
0107260  f227 a048 9006 202c d207 a048 9410 2001 7fff e00f 0100 0000 9010 2000 b010 0008 81c7 e008 81e8 0000 033f ffff 8200 63a0
0107340  9de3 8001 f227 a048 1100 0000 9012 2000 d207 a048 4000 c482 0100 0000 1300 00f5 9212 62e7 4000 c47e 0100 0000 d006 2008
0107420  d202 0000 c202 600c d406 2008 d602 8000 1852 e008 9a10 000c d006 2008 9002 000d 1300 00f5 9212 62e9 9fc0 4000 0100 0000
0107500  9010 2000 b010 0008 81c7 e008 81e8 0000 033f ffff 8200 63c0 9de3 8001 f027 a044 f227 a048 9010 3fff 1080 0003 0100 0000
*
0107640  9010 2000 b010 0008 81c7 e008 81e8 0000 033f ffff 8200 63c0 9de3 8001 f027 a044 f227 a048 f427 a04c f627 a050 9010 2000
0107720  b010 0008 81c7 e008 81e8 0000 033f ffff 8200 63c0 9de3 8001 f027 a044 f227 a048 f427 a04c 9010 2000 b010 0008 81c7 e008
0110000  81e8 0000 033f ffff 8200 63c0 9de3 8001 f027 a044 f227 a048 f427 a04c 9010 2000 b010 0008 81c7 e008 81e8 0000 033f ffff
0110060  8200 63c0 9de3 8001 f027 a044 f227 a048 f427 a04c 9010 2000 1080 0003 0100 0000 9010 2000 b010 0008 81c7 e008 81e8 0000
```

```
0110140  033f ffff 8200 63c0 9de3 8001 f027 a044 f227 a048 9010 2000 1080 0003 0100 0000 9010 2000 b010 0008 81c7 e008 81e8 0000
0110220  033f ffff 8200 63c0 9de3 8001 f027 a044 f227 a048 9010 3fff 1080 0003 0100 0000 9010 2000 b010 0008 81c7 e008 81e8 0000
0110300  033f ffff 8200 63a0 9de3 8001 f22f a04b 1006 2004 d202 2014 8090 0009 0280 000a 0100 0000 9010 0016 4000 c3e7 0100 0000
0110360  8090 0008 1280 0004 0100 0000 1080 0043 0100 0000 d006 2004 d202 2008 d402 6010 d606 2004 d402 e008 da03 200c 80a3 400a
0110440  0a80 0014 0100 0000 de06 2004 e003 e008 e204 2024 c204 6014 e406 2004 e604 a008 e804 e024 ea55 2010 ac10 0015 ee06 2004
0110520  d005 e008 9002 0016 d24f a04b 920a 60ff 9fc0 4000 0100 0000 1080 000d 0100 0000 f206 2004 f406 6008 f606 a00c b606 e001
0110600  f626 a00c b826 e001 d04f a04b 912a 2018 913a 2018 d02f 0000 900a 20ff 80a2 3fff 1280 000e 0100 0000 d006 2004 d202 200c
0110660  9212 6003 d222 200c d406 2004 d602 a010 9612 e003 d622 a010 d806 2004 da03 2010 9a13 6003 da23 2010 de06 2004 e003 e01c
0110740  8090 0010 0280 0008 0100 0000 9010 0018 4000 c3a8 0100 0000 a210 2000 1080 0003 0100 0000 a210 2000 9010 0018 1080 0003
0111020  0100 0000 9010 2000 b010 0008 81c7 e008 81e8 0000 033f ffff 8200 63a0 9de3 8001 8090 0018 1280 0009 0100 0000 9010 203c
0111100  4000 c397 0100 0000 b010 0008 8090 0008 0280 0042 0100 0000 9010 0018 9210 2000 4000 03a1 0100 0000 b010 0008 1100 00f5
0111160  d002 236c d026 0000 9206 2024 8090 0009 1280 0008 0100 0000 9010 200c 4000 c384 0100 0000 8090 0008 0280 000a 0100 0000
0111240  1500 00f5 d402 a3dc d426 202c c026 2028 c026 2024 9610 2000 1080 0003 0100 0000 9610 2000 9806 2024 1b00 00f5 da03 63d8
0111320  da26 202c 9e06 2024 a006 2030 8090 0010 1280 0008 0100 0000 9010 200c 4000 c36c 0100 0000 8090 0008 0280 000a 0100 0000
0111400  2300 00f5 e204 63dc e226 2038 c026 2034 c026 2030 a410 2000 1080 0003 0100 0000 a410 2000 a606 2030 2900 00f5 e805 23d8
0111460  e826 2038 aa06 2030 c026 2008 c026 200c c026 2010 c026 2018 c026 201c c026 2020 ac10 3fff ec26 2014 9010 0018 1080 0003
0111540  0100 0000 9010 2000 b010 0008 81c7 e008 81e8 0000 033f ffff 8200 63a0 9de3 8001 f027 a044 d007 a044 8090 0008 1280 0009
0111620  0100 0000 9010 202c 4000 c341 0100 0000 d027 a044 8090 0008 0280 0068 0100 0000 d007 a044 9210 2000 4000 034b 0100 0000
0111700  d027 a044 d207 a044 1500 00f5 d402 a35c d422 4000 d607 a044 9802 e008 8090 000c 1280 0008 0100 0000 9010 200c 4000 c32c
0111760  0100 0000 8090 0008 0280 000d 0100 0000 da07 a044 1f00 00f5 de03 e3dc de23 6010 e007 a044 c024 200c e207 a044 c024 6008
0112040  a410 2000 1080 0003 0100 0000 a410 2000 e607 a044 a804 e008 ea07 a044 2d00 00f5 ec05 a3d8 ec25 6010 ee07 a044 b005 e008
0112120  f207 a044 b406 6014 8090 001a 1280 0008 0100 0000 9010 200c 4000 c30d 0100 0000 8090 0008 0280 000d 0100 0000 f607 a044
0112200  3900 00f5 f807 23dc f826 e01c fa07 a044 c027 6018 d007 a044 c022 2014 9210 2000 1080 0003 0100 0000 9210 2000 d407 a044
0112260  9602 a014 d807 a044 1b00 00f5 da03 63d8 da23 201c de07 a044 a003 e014 e207 a044 a404 6020 8090 0012 1280 0008 0100 0000
0112340  9010 200c 4000 c2ee 0100 0000 8090 0008 0280 000d 0100 0000 e607 a044 2900 00f5 e805 23dc e824 e028 ea07 a044 c025 6024
0112420  ec07 a044 c025 a020 ae10 2030 1080 0003 0100 0000 ae10 2000 f007 a044 b206 2020 f407 a044 3700 00f5 f606 e3d8 f626 a028
0112500  f807 a044 ba07 2020 d007 a044 1080 0003 0100 0000 9010 2000 b010 0008 81c7 e008 81e8 0000 033f ffff 8200 6370 9de3 8001
0112560  f027 a044 f227 a048 4000 c305 0100 0000 d007 a044 d207 a048 4000 003c 0100 0000 9027 a02c 7fff ff78 0100 0000 9027 a02c
0112640  1300 0124 d202 62cc 7fff f87a 0100 0000 9027 a02c 7fff f3d0 0100 0000 9027 a02c 7fff f50d 0100 0000 9027 a02c 7fff f626
0112720  0100 0000 9010 2000 4000 c2a5 0100 0000 1100 00f5 d002 235c d027 bfd4 9027 a00c 9210 2002 4000 095c 0100 0000 9027 a018
0113000  9210 2002 4000 0958 0100 0000 9027 a024 9210 2002 4000 0954 0100 0000 9010 2000 b010 0008 81c7 e008 81e8 0000 033f ffff
0113060  8200 63a0 9de3 8001 f027 a044 d007 a044 4000 c2be 0100 0000 9002 2001 4000 c294 0100 0000 d207 a044 4000 c2a0 0100 0000
0113140  1080 0003 0100 0000 9010 2000 b010 0008 81c7 e008 81e8 0000 033f ffff 8200 63a0 9de3 8001 f027 a044 f227 a048 d007 a044
0113220  80a2 2001 0480 000a 0100 0000 d207 a048 d202 6004 1100 0124 d002 22cc 4000 c28b 0100 0000 1080 000b 0100 0000 1100 0000
0113300  9012 2000 1300 00f6 9212 60b0 4000 c28c 0100 0000 9010 2001 4000 c265 0100 0000 d007 a044 80a2 2002 0480 000a 0100 0000
0113360  d207 a048 d202 6008 1100 00f5 d002 2358 4000 805f 0100 0000 1080 0008 0100 0000 1100 00f5 d002 2358 1300 00f6 9212 60ca
0113440  4000 8057 0100 0000 9010 2000 b010 0008 81c7 e008 81e8 0000 033f ffff 8200 63a0 9de3 8001 1100 0124 9012 22c8 4000 c266
0113520  0100 0000 ba10 2000 8090 001d 1280 0009 0100 0000 9010 200c 4000 c24d 0100 0000 ba10 0008 8090 0008 0280 0009 0100 0000
0113600  c027 4000 9010 3fff d027 6004 9210 3fff d227 6008 1080 0003 0100 0000 9210 2000 1500 00f5 fa22 a358 9010 2020 4000 c23c
0113660  0100 0000 1700 0124 d022 e2cc 9010 2000 b010 0008 81c7 e008 81e8 0000 033f ffff 8200 63a0 9de3 8001 1100 0124 9012 22c8
0113740  9210 2002 4000 c243 0100 0000 9010 2000 b010 0008 81c7 e008 81e8 0000 033f ffff 8200 63a0 9de3 8001 f227 a048 d007 a048
0114020  7fff ff87 0100 0000 d026 2008 9010 0018 d206 2008 4000 0274 0100 0000 9010 2000 b010 0008 81c7 e008 81e8 0000 033f ffff
0114100  8200 63a0 9de3 8001 f227 a048 1100 0000 9012 2000 d207 a048 4000 c229 0100 0000 d206 2008 4000 c226 0100 0000 1300 00f6
0114160  9212 60d2 4000 c222 0100 0000 9006 200c 1300 00f6 9212 60d4 7fff dd45 0100 0000 9010 2000 b010 0008 81c7 e008 81e8 0000
0114240  033f ffff 8200 63a0 9de3 8001 f227 a048 9006 202c d207 a048 9410 2001 7fff dd90 0100 0000 9010 2000 b010 0008 81c7 e008
0114320  81e8 0000 033f ffff 8200 63a0 9de3 8001 f227 a048 1100 0000 9012 2000 d207 a048 4000 c203 0100 0000 1300 00f6 9212 60d6
0114400  4000 c1ff 0100 0000 d006 2008 d202 0000 c202 600c d406 2008 d602 9000 d852 e008 9a10 000c d006 2008 9002 000d 1300 00f6
0114460  9212 60d8 9fc0 4000 0100 0000 9010 2000 b010 0008 81c7 e008 81e8 0000 033f ffff 8200 63c0 9de3 8001 f027 a044 f227 a048
0114540  9010 3fff 1080 0003 0100 0000 9010 2000 b010 0008 81c7 e008 81e8 0000 033f ffff 8200 63c0 9de3 8001 f027 a044 f227 a048
*
0114700  f427 a04c f627 a050 9010 2000 b010 0008 81c7 e008 81e8 0000 033f ffff 8200 63c0 9de3 8001 f027 a044 f227 a048 f427 a04c
0114760  9010 2000 b010 0008 81c7 e008 81e8 0000 033f ffff 8200 63c0 9de3 8001 f027 a044 f227 a048 f427 a04c 9010 2000 b010 0008
0115040  81c7 e008 81e8 0000 033f ffff 8200 63c0 9de3 8001 f027 a044 f227 a048 f427 a04c 9010 2000 1080 0003 0100 0000 9010 2000
0115120  b010 0008 81c7 e008 81e8 0000 033f ffff 8200 63c0 9de3 8001 f027 a044 f227 a048 9010 2000 1080 0003 0100 0000 9010 2000
0115200  b010 0008 81c7 e008 81e8 0000 033f ffff 8200 63c0 9de3 8001 f027 a044 f227 a048 9010 3fff 1080 0003 0100 0000 9010 2000
```

```
0115260  b010 0008 81c7 e008 81e8 0000 0000 0000 033f ffff 8200 6388 9de3 8001 f027 a044 f22f a04b f427 a04c f627 a050 f827 a054
0115340  fa27 a058 d007 a060 d023 a05c d207 a064 d223 a060 d407 a068 d423 a064 d607 a06c d623 a068 d807 a070 d823 a06c da07 a074
0115420  da23 a070 1100 0121 9012 2398 d207 a04c d407 a050 d607 a054 d807 a058 da07 a05c 4000 c161 0100 0000 d24f a04b 1100 00f6
0115500  9012 21f8 d407 a044 1700 0121 9612 e398 4000 c183 0100 0000 81c7 e008 81e8 0000 033f ffff 8200 63b8 9de3 8001 f027 a044
0115560  d007 a044 d027 bffc d007 a044 d24a 0000 9410 0009 8090 000a 0280 001e 0100 0000 d007 a044 d24a 0000 9410 0009 1700 011e
0115640  9612 e199 d84a 800b 9a10 000c 808b 6002 0280 000f 0100 0000 d007 a044 d24a 0000 d22f bffb d44f bffb 9610 000a 9822 e020
0115720  da07 a044 d82b 4000 de07 a044 9e03 e001 de27 a044 1080 0005 0100 0000 e007 a044 a004 2001 e027 a044 10bf ffe0 0100 0000
0116000  d007 bffc 1080 0003 0100 0000 9010 2000 b010 0008 81c7 e008 81e8 0000 033f ffff 8200 63b8 9de3 8001 f027 a044 d007 a044
0116060  d027 bffc d007 a044 d24a 0000 9410 0009 8090 000a 0280 001e 0100 0000 d007 a044 d24a 0000 9410 0009 1700 011e 9612 e199
0116140  d84a 800b 9a10 000c 808b 6001 0280 000f 0100 0000 d007 a044 d24a 0000 d22f bffb d44f bffb 9610 000a 9802 e020 da07 a044
0116220  d82b 4000 de07 a044 9e03 e001 de27 a044 1080 0005 0100 0000 e007 a044 a004 2001 e027 a044 10bf ffe0 0100 0000 d007 bffc
0116300  1080 0003 0100 0000 9010 2000 b010 0008 81c7 e008 81e8 0000 033f ffff 8200 6388 9de3 8001 f027 a044 f227 a048 f427 a04c
0116360  f627 a050 f827 a054 fa27 a058 d007 a058 d023 a05c d207 a05c d223 a060 d407 a060 d423 a064 d607 a064 d623 a068 d807 a068
0116440  d823 a06c da07 a06c da23 a070 1100 00f0 d002 23c0 d207 a044 d407 a048 d607 a04c d807 a050 da07 a054 4000 c0db 0100 0000
0116520  1100 00f0 d002 23c0 1080 0003 0100 0000 9010 2000 b010 0008 81c7 e008 81e8 0000 033f ffff 8200 6390 9de3 8001 f027 a044
0116600  f227 a048 f427 a04c f627 a050 c027 bff4 4000 8986 0100 0000 d027 bff0 d007 a04c 1300 00f6 9212 6209 4000 c0cc 0100 0000
0116660  d007 a050 1300 00f6 9212 620b 4000 c0c7 0100 0000 9010 2002 d023 a05c d007 bff0 1300 00f6 9212 620e 9410 2002 9610 3fff
0116740  9810 2002 9a10 2002 4000 54ce 0100 0000 d027 bffc d007 bffc d207 a048 9410 2003 4000 5689 0100 0000 d007 bffc 9210 2000
0117020  1500 00f6 9412 a20f 4000 5579 0100 0000 d007 bffc 1300 008e 9212 6344 d407 a044 4000 57e5 0100 0000 d007 bffc 4000 5c71
0117100  0100 0000 d027 bff8 80a2 3fff 0280 002a 0100 0000 1080 0020 0100 0000 d007 bff4 8090 0008 1280 000d 0100 0000 d007 a04c
0117160  d207 bffc 4000 c0b7 0100 0000 d007 a04c 1300 00f6 9212 6215 4000 c0b2 0100 0000 1080 000b 0100 0000 d007 a050 d207 bffc
0117240  4000 c0ac 0100 0000 d007 a04c 1300 00f6 9212 6217 4000 c0a7 0100 0000 1080 000c 0100 0000 9010 2001 d027 bff4 1080 0008
0117320  0100 0000 d007 bff8 80a2 2002 02bf ffe0 80a2 2003 02bf fff8 0100 0000 10bf ffd3 0100 0000 d007 bff4 1080 0003 0100 0000
0117400  9010 2000 b010 0008 81c7 e008 81e8 0000 033f ffff 8200 63c0 9de3 8001 f027 a044 d007 a044 8090 0008 1280 0006 0100 0000
0117460  1100 00f6 d002 20ec 1080 000f 0100 0000 d207 a044 80a2 6001 1280 0006 0100 0000 1100 00f6 d002 20e8 1080 0007 0100 0000
0117540  1100 00f6 9012 2219 1080 0003 0100 0000 9010 2000 b010 0008 81c7 e008 81e8 0000 033f ffff 8200 63a0 9de3 8001 f22f a04b
0117620  d006 2004 d202 2014 8090 0009 0280 000a 0100 0000 9010 0018 4000 c037 0100 0000 8090 0008 1280 0004 0100 0000 1080 0043
0117700  0100 0000 d006 2004 d202 2008 d402 6010 1606 2004 d802 e008 da03 200c 80a3 400a 0a80 0014 0100 0000 de06 2004 e003 e008
0117760  e204 2024 c204 6014 e406 2004 e604 a008 e804 e024 ea55 2010 ac10 0015 ee06 2004 d005 e008 9002 0016 d24f a04b 920a 60ff
0120040  9fc0 4000 0100 0000 1080 000d 0100 0000 f206 2004 f406 6008 f606 a00c b606 e001 f626 a00c b826 e001 d04f a04b 912a 2018
0120120  913a 2018 d02f 0000 900a 20ff 80a2 3fff 1280 000e 0100 0000 d006 2004 d202 200c 9212 6003 d222 200c d406 2004 d602 a010
0120200  9612 e003 d622 a010 d806 2004 da03 2010 9a13 6003 da23 2010 de06 2004 e003 e01c 8090 0010 0280 0008 0100 0000 9010 0018
0120260  4000 bff8 0100 0000 a210 2000 1080 0003 0100 0000 a210 2000 9010 0018 1080 0003 0100 0000 9010 2000 b010 0008 81c7 e008
0120340  81e8 0000 033f ffff 8200 63a0 9de3 8001 f227 a048 8090 0018 1280 0009 0100 0000 9010 2008 4000 bfe6 0100 0000 b010 0008
0120420  8090 0008 0280 0031 0100 0000 8090 0018 1280 0008 0100 0000 9010 2004 4000 bfdc 0100 0000 8090 0008 0280 0007 0100 0000
0120500  1100 00f6 d002 2284 d026 0000 1080 0003 0100 0000 9010 2000 1300 00f6 d202 6280 d226 0000 d407 a048 8090 000a 0280 001a
0120560  0100 0000 d007 a048 4000 bff0 0100 0000 9002 2001 4000 bfc6 0100 0000 d026 2004 8090 0008 0280 0008 0100 0000 d006 2004
0120640  d207 a048 4000 bfcd 0100 0000 1080 0008 0100 0000 9010 0018 1300 00f6 9212 6288 d407 a048 4000 011c 0100 0000 1080 0003
0120720  0100 0000 c026 2004 9010 0018 1080 0003 0100 0000 9010 2000 b010 0008 81c7 e008 81e8 0000 033f ffff 8200 63a0 9de3 8001
0121000  f227 a048 d006 2004 8090 0008 0280 0005 0100 0000 d006 2004 4000 bfd7 0100 0000 d007 a048 8090 0008 0280 001a 0100 0000
0121060  d007 a048 4000 bfc1 0100 0000 9002 2001 4000 bf97 0100 0000 d026 2004 8090 0008 0280 0008 0100 0000 d006 2004 d207 a048
0121140  4000 bf9e 0100 0000 1080 0008 0100 0000 9010 0018 1300 00f6 9212 6299 d407 a048 4000 00ed 0100 0000 1080 0003 0100 0000
0121220  c026 2004 9010 2000 b010 0008 81c7 e008 81e8 0000 033f ffff 8200 63a0 9de3 8001 1100 0124 9012 22d0 4000 bf8b 0100 0000
0121300  9010 2000 b010 0008 81c7 e008 81e8 0000 033f ffff 8200 63a0 9de3 8001 1100 0124 9012 22d0 9210 2002 4000 bf82 0100 0000
0121360  9010 2000 b010 0008 81c7 e008 81e8 0000 033f ffff 8200 63c0 9de3 8001 f027 a044 f227 a048 9010 3fff 1080 0003 0100 0000
*
0121520  9010 2000 b010 0008 81c7 e008 81e8 0000 033f ffff 8200 63c0 9de3 8001 f027 a044 f227 a048 f427 a04c f627 a050 9010 2000
0121600  b010 0008 81c7 e008 81e8 0000 033f ffff 8200 63c0 9de3 8001 f027 a044 f227 a048 f427 a04c 9010 2000 b010 0008 81c7 e008
0121660  81e8 0000 033f ffff 8200 63c0 9de3 8001 f027 a044 f227 a048 f427 a04c 9010 2000 b010 0008 81c7 e008 81e8 0000 033f ffff
0121740  8200 63c0 9de3 8001 f027 a044 f227 a048 f427 a04c 9010 2000 1080 0003 0100 0000 9010 2000 b010 0008 81c7 e008 81e8 0000
0122020  033f ffff 8200 63c0 9de3 8001 f027 a044 f227 a048 9010 2000 1080 0003 0100 0000 9010 2000 b010 0008 81c7 e008 81e8 0000
0122100  033f ffff 8200 63a0 9de3 8001 f227 a048 1100 0100 9012 2000 d207 a048 4000 bf28 0100 0000 1300 00f6 9212 62aa 4000 bf24
0122160  0100 0000 d206 2004 4000 bf21 0100 0000 1300 00f6 9212 62ae 4000 bf1d 0100 0000 9010 2000 b010 0008 81c7 e008 81e8 0000
0122240  033f ffff 8200 63c0 9de3 8001 f027 a044 f227 a048 9010 3fff 1080 0003 0100 0000 9010 2000 b010 0008 81c7 e008 81e8 0000
0122320  033f ffff 8200 63a0 9de3 8001 f22f a04b d006 2004 d202 2014 8090 0009 0280 000a 0100 0000 9010 0018 4000 bee3 0100 0000
```

```
0122400  8090 0008 1280 0004 0100 0000 1080 0043 0100 0000 d006 2004 d202 2008 d402 6010 d606 2004 d802 e008 da03 200c 80a3 400a
0122460  0a80 0014 0100 0000 de06 2004 e003 e008 e204 2024 c204 6014 e406 2004 e604 a008 e804 e024 ea55 2010 ac10 0015 ee06 2004
0122540  0005 e008 9002 0016 d24f a04b 920a 60ff 9fc0 4000 0100 0000 1080 000d 0100 0000 f206 2004 f406 6008 f606 a00c b606 e001
0122620  f626 a00c b826 e001 d04f a04b 912a 2018 913a 2018 d02f 0000 900a 20ff 80a2 3fff 1280 000e 0100 0000 d006 2004 d202 200c
0122700  9212 6003 d222 200c d406 2004 d602 a010 9612 e003 d622 a010 d806 2004 da03 2010 9a13 6003 da23 2010 de06 2004 e003 e01c
0122760  8090 0010 0280 0008 0100 0000 9010 0018 4000 bea4 0100 0000 a210 2000 1080 0003 0100 0000 a210 2000 9010 0018 1080 0003
0123040  0100 0000 9010 2000 b010 0008 81c7 e008 81e8 0000 033f ffff 8200 63a0 9de3 8001 f027 a044 f227 a048 f427 a04c 1100 00f6
0123120  9012 22d8 d207 a048 d407 a04c 4000 bec0 0100 0000 9010 2001 4000 be81 0100 0000 9010 2000 b010 0008 81c7 e008 81e8 0000
0123200  033f ffff 8200 63a0 9de3 8001 f027 a044 f227 a048 1100 00f6 9012 2311 d207 a048 4000 beaf 0100 0000 9010 2000 b010 0008
0123260  81c7 e008 81e8 0000 033f ffff 8200 63a0 9de3 8001 1100 0124 9012 22d8 4000 be86 0100 0000 9010 2000 b010 0008 81c7 e008
0123340  81e8 0000 033f ffff 8200 63a0 9de3 8001 1100 0124 9012 22d8 9210 2002 4000 be7d 0100 0000 9010 2000 b010 0008 81c7 e008
0123420  81e8 0000 033f ffff 8200 63c0 9de3 8001 f027 a044 f227 a048 9010 3fff 1080 0003 0100 0000 9010 2000 b010 0008 81c7 e008
0123500  81e8 0000 0000 0000 033f ffff 8200 63a0 9de3 8001 f22f a04b d006 2004 d202 2014 8090 0009 0280 000a 0100 0000 9010 0018
0123560  4000 be45 0100 0000 8090 0008 1280 0004 0100 0000 1080 0043 0100 0000 d006 2004 d202 2008 d402 6010 d606 2004 d802 e008
0123640  da03 200c 80a3 400a 0a80 0014 0100 0000 de06 2004 e003 e008 e204 2024 c204 6014 e406 2004 e604 a008 e804 e024 ea55 2010
0123720  ac10 0015 ee06 2004 0005 e008 9002 0016 d24f a04b 920a 60ff 9fc0 4000 0100 0000 1080 000d 0100 0000 f206 2004 f406 6008
0124000  f606 a00c b606 e001 f626 a00c b826 e001 d04f a04b 912a 2018 913a 2018 d02f 0000 900a 20ff 80a2 3fff 1280 000e 0100 0000
0124060  d006 2004 d202 200c 9212 6003 d222 200c d406 2004 d602 a010 9612 e003 d622 a010 d806 2004 da03 2010 9a13 6003 da23 2010
0124140  de06 2004 e003 e01c 8090 0010 0280 0008 0100 0000 9010 0018 4000 be06 0100 0000 a210 2000 1080 0003 0100 0000 a210 2000
0124220  9010 0018 1080 0003 0100 0000 9010 2000 b010 0008 81c7 e008 81e8 0000 033f ffff 8200 63a0 9de3 8001 f027 a044 f227 a048
0124300  d007 a044 d207 a048 4000 04dc 0100 0000 d007 a048 d002 2008 1080 0003 0100 0000 9010 2000 b010 0008 81c7 e008 81e8 0000
0124360  033f ffff 8200 6388 9de3 8001 f227 a048 d007 a048 d202 2004 d227 bffc d407 bffc 8090 000a 0280 0057 0100 0000 c027 bff4
0124440  d007 bffc d202 2008 d227 bff0 d407 bff4 8090 000a 1280 0009 0100 0000 9010 200c 4000 bdd7 0100 0000 d027 bff4 8090 0008
0124520  0280 0034 0100 0000 d607 bff4 d627 bfec c027 bfe8 d807 bfec 8090 000c 1280 0009 0100 0000 9010 2008 4000 bdc9 0100 0000
0124600  d027 bfec 8090 0008 0280 001a 0100 0000 da07 bfec 8090 000d 1280 0008 0100 0000 9010 2004 4000 bdbe 0100 0000 8090 0008
0124660  0280 0008 0100 0000 de07 bfec 2100 00f6 e004 238c e023 c000 1080 0003 0100 0000 a010 2000 e207 bfec e227 bfec e407 bfec
0124740  e607 bfe8 e624 a004 1080 0003 0100 0000 a610 2000 e837 bfec e827 bff4 ea07 bff4 2d00 00f6 ec05 a388 ec25 4000 ee07 bff4
0125020  f207 bff0 f225 e008 1080 0003 0100 0000 b210 2000 f407 bff4 f427 bff8 9010 0018 d207 bff8 7fff ff9e 0100 0000 f607 bffc
0125100  f806 e004 8090 001c 0280 0006 0100 0000 fa07 bffc d007 6004 1080 0003 0100 0000 9010 2000 d027 bffc 10bf ffa9 0100 0000
0125160  9010 2000 b010 0008 81c7 e008 81e8 0000 033f ffff 8200 6380 9de3 8001 f227 a048 d007 a048 d202 2008 d227 bffc d406 2004
0125240  d427 bff8 d607 bff8 d802 e008 d827 bff4 da07 bffc de03 6004 e007 bff4 e204 2004 80a4 400f 1280 0018 0100 0000 d007 bff8
0125320  d202 2004 8090 0009 0280 0006 0100 0000 d407 bff8 d602 a004 1080 0003 0100 0000 9610 2000 d627 bfec d807 bfec d826 2004
0125400  d007 bff8 4000 bd9c 0100 0000 da06 0000 9a23 6001 da26 0000 9010 2001 1080 0047 0100 0000 de07 bff8 e003 e004 8090 0010
0125460  0280 0006 0100 0000 e207 bff8 e404 6004 1080 0003 0100 0000 a410 2000 e427 bff0 e607 bff0 8090 0013 0280 0034 0100 0000
0125540  d007 bff0 d202 2008 d227 bff4 d407 bffc d602 a004 d807 bff4 da03 2004 80a3 400b 1280 001b 0100 0000 d007 bff8 d027 bfe8
0125620  d207 bff0 d402 6004 8090 000a 0280 0006 0100 0000 d607 bff0 d802 e004 1080 0003 0100 0000 9810 2000 d827 bfe4 da07 bfe8
0125700  de07 bfe4 de23 6004 d007 bff0 4000 bd6a 0100 0000 e006 0000 a024 2001 e026 0000 9010 2001 1080 0015 0100 0000 e207 bff0
0125760  e227 bff8 e407 bff0 e604 a004 8090 0013 0280 0006 0100 0000 e807 bff0 ea05 2004 1080 0003 0100 0000 aa10 2000 ea27 bff0
0126040  10bf ffcc 0100 0000 9010 2000 1080 0003 0100 0000 9010 2000 b010 0008 81c7 e008 81e8 0000 033f ffff 8200 6380 9de3 8001
0126120  f227 a048 d006 2004 d027 bff0 d207 bff0 d402 6008 d427 bff8 d607 bff8 d002 e004 d207 a048 4000 bd2b 0100 0000 8090 0008
0126200  1280 0018 0100 0000 d007 bff0 d202 2004 8090 0009 0280 0006 0100 0000 d407 bff0 d602 a004 1080 0003 0100 0000 9610 2000
0126260  d627 bfec d807 bfec d826 2004 d007 bff0 4000 bd2d 0100 0000 da06 0000 9a23 6001 da26 0000 9010 2001 1080 0048 0100 0000
0126340  de07 bff0 e003 e004 8090 0010 0280 0006 0100 0000 e207 bff0 e404 6004 1080 0003 0100 0000 a410 2000 e427 bffc e607 bffc
0126420  8090 0013 0280 0035 0100 0000 d007 bffc d202 2008 d227 bff4 d407 bff4 d002 a004 d207 a048 4000 bcfb 0100 0000 8090 0008
0126500  1280 001b 0100 0000 d007 bff0 d027 bfe8 d207 bffc d402 6004 8090 000a 0280 0006 0100 0000 d607 bffc d802 e004 1080 0003
0126560  0100 0000 9810 2000 d827 bfe4 da07 bfe8 de07 bfe4 de23 6004 d007 bffc 4000 bcfa 0100 0000 e006 0000 a024 2001 e026 0000
0126640  9010 2001 1080 0015 0100 0000 e207 bffc e227 bff0 e407 bffc e604 a004 8090 0013 0280 0006 0100 0000 e807 bffc ea05 2004
0126720  1080 0003 0100 0000 aa10 2000 ea27 bffc 10bf ffcb 0100 0000 9010 2000 1080 0003 0100 0000 9010 2000 b010 0008 81c7 e008
0127000  81e8 0000 033f ffff 8200 63b0 9de3 8001 f227 a048 f427 a04c d007 a048 8090 0008 1280 000a 0100 0000 d007 a04c d026 2004
0127060  d207 a04c d227 bff4 c027 bff0 d407 bff4 d607 bff0 d622 a004 c027 bff8 d806 2004 d827 bffc da07 bffc 8090 000d 0280 0031
0127140  0100 0000 de07 bff8 8090 000f 1280 002d 0100 0000 e007 bffc e207 a048 80a4 0011 1280 001b 0100 0000 d007 a04c d027 bff4
0127220  d207 bffc d402 6004 8090 000a 0280 0006 0100 0000 d607 bffc d802 e004 1080 0003 0100 0000 9810 2000 d827 bff0 da07 bff4
0127300  de07 bff0 de23 6004 e007 a048 e027 bff4 e207 a04c e227 bff0 e407 bff4 e607 bff0 e624 a004 a810 2001 e827 bff8 ea07 bffc
0127360  ec05 6004 8090 0016 0280 0006 0100 0000 ee07 bffc f205 e004 1080 0003 0100 0000 b210 2000 f227 bffc 10bf ffcf 0100 0000
0127440  f407 bff8 8090 001a 1280 000b 0100 0000 d007 a04c d027 bff4 d206 2004 d227 bff0 d407 bff4 d607 bff0 d622 a004 d807 a04c
```

```
0127520  d826 2004 9010 2000 b010 0008 81c7 e008 81e8 0000 033f ffff 8200 6390 9de3 8001 f227 a048 c027 bffc c027 bff8 d007 a048
0127600  8090 0008 1280 0005 0100 0000 9010 2000 1080 002e 0100 0000 d207 a049 d402 6008 d427 bff8 8090 000a 0280 0024 0100 0000
0127660  d606 2004 d627 bffc d807 bffc 8090 000c 0280 001e 0100 0000 da07 bffc de03 6008 de27 bff4 e007 bff4 d004 2004 e207 bff8
0127740  d204 6004 4000 bc4f 0100 0000 8090 0008 1280 0005 0100 0000 d007 bffc 1080 0013 0100 0000 e407 bffc e604 a004 8090 0013
0130020  0280 0006 0100 0000 e807 bffc ea05 2004 1080 0003 0100 0000 aa10 2000 ea27 bffc 10bf ffe2 0100 0000 9010 2000 1080 0003
0130100  0100 0000 9010 2000 b010 0008 81c7 e008 81e8 0000 033f ffff 8200 6399 9de3 8001 f227 a048 c027 bffc d006 2004 d027 bffc
0130160  d207 bffc 8090 0009 0280 001e 0100 0000 d407 bffc d602 a008 d627 bff8 d807 bff8 d003 2004 d207 a048 4000 bc22 0100 0000
0130240  8090 0008 1280 0006 0100 0000 da07 bffc d003 6008 1080 0013 0100 0000 de07 bffc e003 e004 8090 0010 0280 0006 0100 0000
0130320  e207 bffc e404 6004 1080 0003 0100 0000 a410 2000 e427 bffc 10bf ffe2 0100 0000 9010 2000 1080 0003 0100 0000 9010 2000
0130400  b010 0008 81c7 e008 81e8 0000 033f ffff 8200 6398 9de3 8001 f227 a048 d007 a048 d202 0000 d406 0000 80a2 8009 0280 0005
0130460  0100 0000 9010 2000 1080 0029 0100 0000 d607 a048 d802 e004 d827 bffc da07 bffc 8090 000d 0280 001e 0100 0000 de06 2008
0130540  c203 e014 e006 2008 e254 2010 a410 0011 9006 0012 d207 bffc 9fc0 4000 0100 0000 8090 0008 1280 0005 0100 0000 9010 2000
0130620  1080 0013 0100 0000 e607 bffc e804 e004 8090 0014 0280 0006 0100 0000 ea07 bffc ec05 6004 1080 0003 0100 0000 ac10 2000
0130700  ec27 bffc 10bf ffe2 0100 0000 9010 2001 1080 0003 0100 0000 9010 2000 b010 0008 81c7 e008 81e8 0000 033f ffff 8200 6398
0130760  9de3 8001 f227 a048 d006 2004 8090 0008 0280 002d 0100 0000 1100 0000 9012 2000 d207 a048 4000 bbba 0100 0000 1300 00f6
0131040  9212 6390 4000 bbb6 0100 0000 d006 2004 d027 bffc d207 bffc 8090 0009 0280 001e 0100 0000 d407 bffc d602 a008 d627 bff8
0131120  d807 bff8 da03 0000 c203 600c de07 bff8 e003 c000 e254 2008 a410 0011 d007 bff8 9002 0012 d207 a048 9fc0 4000 0100 0000
0131200  e607 bffc e804 e004 8090 0014 0280 0006 0100 0000 ea07 bffc ec05 6004 1080 0003 0100 0000 ac10 2000 ec27 bffc 10bf ffe2
0131260  0100 0000 9010 2000 b010 0008 81c7 e008 81e8 0000 033f ffff 8200 6368 9de3 8001 f227 a048 9010 2001 d027 bfdc d206 0000
0131340  8090 0009 0280 0006 0100 0000 d406 0000 80a2 a001 1280 0004 0100 0000 1080 011c 0100 0000 d606 2004 d627 bffc c026 2004
0131420  c027 bfd8 d807 bffc da03 2008 da27 bfd4 de07 bfd8 8090 000f 1280 0009 0100 0000 9010 200c 4000 bb5a 0100 0000 d027 bfd8
0131500  8090 0008 0280 0034 0100 0000 e007 bfd8 e027 bfd0 c027 bfcc e207 bfd0 8090 0011 1280 0009 0100 0000 9010 2008 4000 bb4c
0131560  0100 0000 d027 bfd0 8090 0008 0280 001a 0100 0000 e407 bfd0 8090 0012 1280 0008 0100 0000 9010 2004 4000 bb41 0100 0000
0131640  8090 0008 0280 0008 0100 0000 e607 bfd0 2900 00f6 e805 238c e824 c000 1080 0003 0100 0000 a810 2000 ea07 bfd0 ea27 bfd0
0131720  ec07 bfd0 ee07 bfcc ee25 a004 1080 0003 0100 0000 ae10 2000 f207 bfd0 f227 bfd8 f407 bfd8 3700 00f6 f606 e388 f626 8000
0132000  f807 bfd8 fa07 bfd4 fa27 2008 1080 0003 0100 0000 ba10 2000 9010 0018 d207 bfd8 7fff fd23 0100 0000 d007 bffc d202 2004
0132060  8090 0009 0280 0006 0100 0000 d407 bffc d602 a004 1080 0003 0100 0000 9610 2000 d627 bff8 d807 bff8 8090 000c 0280 00bc
0132140  0100 0000 d007 bff8 d202 2008 d227 bfe8 c027 bfe0 9410 2001 d427 bfdc d606 2004 d627 bff4 d807 bff4 8090 000c 0280 0053
0132220  0100 0000 da07 bfe0 8090 000d 1280 004f 0100 0000 d007 bff4 d202 2004 8090 0009 0280 0006 0100 0000 d407 bff4 d602 a004
0132300  1080 0003 0100 0000 9610 2000 d627 bff0 d807 bfe8 da03 0000 c203 6044 de07 bfe8 e003 c000 e254 2040 a410 0011 d007 bfe8
0132360  9002 0012 e607 bff4 d204 e008 9fc0 4000 0100 0000 8090 0008 0280 0022 0100 0000 d007 bff0 8090 0008 0280 0016 0100 0000
0132440  d207 bfe8 d402 4000 c202 a04c d607 bfe8 d802 c000 da53 2048 9e10 0003 d007 bfe8 9002 000f e007 bff0 d204 2008 9fc0 4000
0132520  0100 0000 8090 0008 0280 0006 0100 0000 a210 2001 e227 bfe0 1080 0008 0100 0000 e407 bff0 8090 0012 1280 0004 0100 0000
0132600  a610 2001 e627 bfe0 1080 0005 0100 0000 c027 bfdc 9010 2001 d027 bfe0 d207 bff4 d227 bfec d407 bff4 d602 a004 8090 000b
0132660  0280 0006 0100 0000 d807 bff4 da03 2004 1080 0003 0100 0000 9a10 2000 da27 bff4 10bf ffad 0100 0000 c027 bfd8 de07 bfd8
0132740  8090 000f 1280 0009 0100 0000 9010 200c 4000 baab 0100 0000 d027 bfd8 8090 0008 0280 0034 0100 0000 e007 bfd8 e027 bfd0
0133020  c027 bfcc e207 bfd0 8090 0011 1280 0009 0100 0000 9010 2008 4000 ba9d 0100 0000 d027 bfd0 8090 0008 0280 001a 0100 0000
0133100  e407 bfd0 8090 0012 1280 0008 0100 0000 9010 2004 4000 ba92 0100 0000 8090 0008 0280 0008 0100 0000 e607 bfd0 2900 00f6
0133160  e805 238c e824 c000 1080 0003 0100 0000 a810 2000 ea07 bfd0 ea27 bfd0 ec07 bfd0 ee07 bfcc ee25 a004 1080 0003 0100 0000
0133240  ae10 2000 f207 bfd0 f227 bfd8 f407 bfd8 3700 00f6 f606 e388 f626 8000 f807 bfd8 fa07 bfe8 fa27 2008 1080 0003 0100 0000
0133320  ba10 2000 d007 bfd8 d027 bfe4 d207 bfdc 8090 0009 0280 0009 0100 0000 9010 0018 d207 bfec d407 bfe4 7fff fdc3 0100 0000
0133400  1080 0006 0100 0000 9010 0018 d207 bfe4 7fff fc67 0100 0000 d407 bff8 d602 a004 8090 000b 0280 0006 0100 0000 d807 bff8
0133460  da03 2004 1080 0003 0100 0000 9a10 2000 da27 bff8 10bf ff44 0100 0000 de07 a048 8090 000f 1280 0005 0100 0000 9010 0018
0133540  4000 0006 0100 0000 9010 2000 b010 0008 81c7 e008 81e8 0000 033f ffff 8200 6388 9de3 8001 d006 2004 d027 bffc c026 2004
0133620  d207 bffc 8090 0009 0280 0055 0100 0000 c027 bff8 d407 bffc d602 a008 d627 bff4 d807 bff8 8090 000c 1280 0009 0100 0000
0133700  9010 200c 4000 ba36 0100 0000 d027 bff8 8090 0008 0280 0034 0100 0000 da07 bff8 da27 bff0 c027 bfec de07 bff0 8090 000f
0133760  1280 0009 0100 0000 9010 2008 4000 ba28 0100 0000 d027 bff0 8090 0008 0280 001a 0100 0000 e007 bff0 8090 0010 1280 0008
0134040  0100 0000 9010 2004 4000 ba1d 0100 0000 8090 0008 0280 0008 0100 0000 e207 bff0 2500 00f6 e404 a38c e424 4000 1080 0003
0134120  0100 0000 a410 2000 e607 bff0 e627 bff0 e807 bff0 ea07 bfec ea25 2004 1080 0003 0100 0000 aa10 2000 ec07 bff0 ec27 bff8
0134200  ee07 bff8 3300 00f6 f206 6388 f225 c000 f407 bff8 f607 bff4 f626 a008 1080 0003 0100 0000 b610 2000 9010 0018 d207 bff8
0134260  7fff fbff 0100 0000 f807 bffc fa07 2004 8090 001d 0280 0006 0100 0000 d007 bffc d202 2004 1080 0003 0100 0000 9210 2000
0134340  d227 bffc 10bf ffab 0100 0000 9010 2000 b010 0008 81c7 e008 81e8 0000 033f ffff 8200 63a0 9de3 8001 1100 0124 9012 22e0
0134420  4000 b9f5 0100 0000 9010 2000 b010 0008 81c7 e008 81e8 0000 033f ffff 8200 63a0 9de3 8001 1100 0124 9012 22e0 9210 2002
0134500  4000 b9ec 0100 0000 9010 2000 b010 0008 81c7 e008 81e8 0000 033f ffff 8200 63a0 9de3 8001 f227 a048 1100 0000 9012 2000
0134560  d207 a048 4000 b9e2 0100 0000 1300 00f6 9212 6394 4000 b9de 0100 0000 d006 2008 d202 0000 c202 600c d406 2008 d602 8000
```

```
0134640 d852 e008 9a10 000c d006 2008 9002 000d 1300 00f6 9212 6396 9fc0 4000 0100 0000 9010 2000 b010 0008 81c7 e008 81e8 0000
0134720 033f ffff 8200 63c0 9de3 8001 f027 a044 f227 a048 9010 3fff 1080 0003 0100 0000 9010 2000 b010 0008 81c7 e008 81e8 0000
0135000 033f ffff 8200 63a0 9de3 8001 f22f a04b d006 2004 d202 2014 8090 0003 0280 000a 0100 0000 9010 0018 4000 b997 0100 0000
0135060 8090 0008 1280 0004 0100 0000 1080 0043 0100 0000 d006 2004 d202 2008 d402 6010 d606 2004 d802 e008 da03 200c 80a3 400a
0135140 0a80 0014 0100 0000 de06 2004 e003 e008 e204 2024 c204 6014 e406 2004 e604 a008 e804 e024 ea55 2310 ac10 0015 ee06 2004
0135220 d005 e008 9002 0016 d24f a04b 920a 60ff 9fc0 4000 0100 0000 1080 0001 0100 0000 f206 2004 f406 6008 f606 a00c b606 e001
0135300 f626 a00c b826 e001 d04f a04b 912a 2018 913a 2018 d02f 0000 900a 20ff 80a2 3fff 1280 000e 0100 0000 d006 2004 d202 200c
0135360 9212 6003 d222 200c d406 2004 d602 a010 9612 e003 d622 a010 d806 2004 da03 2010 9a13 6003 da23 2010 de06 2004 e003 e01c
0135440 809c 0010 0280 0008 0100 0000 9010 0018 4000 b958 0100 0000 a210 2000 1080 0003 0100 0000 a210 2000 9010 0018 1080 0003
0135520 0100 0000 9010 2000 b010 0008 81c7 e008 81e8 0000 033f ffff 8200 6399 9de3 8001 f027 a044 f227 a048 d007 a044 8090 0008
0135600 0280 002a 0100 0000 d007 a044 1300 00f6 d292 63d8 d222 2008 d407 a044 d602 a004 d627 bffc d807 bffc 8090 000c 0280 0014
0135660 0100 0000 d007 bffc d202 2004 8090 0009 0280 0006 0100 0000 d407 bffc d602 a004 1080 0003 0100 0000 9610 2000 d627 bff8
0135740 d007 bffc 4000 b964 0100 0000 d807 bff8 d827 bffc 10bf ffec 0100 0000 da07 a044 8090 000d 0280 0009 0100 0000 de07 a048
0136020 808b e001 0280 0005 0100 0000 d007 a044 4000 b955 0100 0000 9010 2000 b010 0008 81c7 e008 81e8 0000 033f ffff 8200 63b8
0136100 9de3 8001 f227 a048 d006 2004 8090 0008 0280 000d 0100 0000 d007 a048 d027 bffc d206 2004 d227 bff8 d407 bffc d607 bff8
0136160 d622 a004 d807 a048 d826 2004 1080 0004 0100 0000 da07 a048 da26 2004 de06 0000 9e03 e001 de26 0000 9010 2000 b010 0008
0136240 81c7 e008 81e8 0000 033f ffff 8200 63a0 9de3 8001 f027 a044 f227 a048 f427 a04c 1100 00f7 9012 2008 d207 a048 d407 a04c
0136320 4000 b923 0100 0000 9010 2001 4000 b8e4 0100 0000 9010 2000 b010 0008 81c7 e008 81e8 0000 033f ffff 8200 6398 9de3 8001
0136400 f027 a044 d007 a044 d202 2004 d227 bffc d407 bffc 8090 000a 0280 0031 0100 0000 d656 6002 9810 000b 8090 000c 1680 000c
0136460 0100 0000 c206 6004 da56 4000 9e10 000d d007 bffc 9002 000f 9fc0 4000 0100 0000 a010 0008 1080 0015 0100 0000 e256 6002
0136540 a410 0011 a72c a003 e807 bffc ea05 0000 ac05 4013 c205 a004 ee07 bffc f005 c000 f456 6002 b610 001a b92e e003 fa56 001c
0136620 9010 001d d207 bffc 9002 4008 9fc0 4000 0100 0000 a010 0008 d407 bffc d602 a004 8090 000b 0280 0006 0100 0000 d807 bffc
0136700 da03 2004 1080 0003 0100 0000 9a10 2000 da27 bffc 10bf ffcf 0100 0000 9010 2000 b010 0008 81c7 e008 81e8 0000 033f ffff
0136760 8200 6398 9de3 8001 f227 a048 d006 2004 8090 0008 0280 002a 0100 0000 1100 0000 9012 2000 d207 a048 4000 b8b9 0100 0000
0137040 1300 00f7 9212 6041 4000 b8b5 0100 0000 d006 2004 d027 bffc d207 bffc 8090 0009 0280 001b 0100 0000 d407 bffc d602 8000
0137120 c202 e00c d807 bffc da03 0000 de53 6008 a010 000f d007 bffc 9002 0010 d207 a048 9fc0 4000 0100 0000 e207 bffc e404 6004
0137200 8090 0012 0280 0006 0100 0000 e607 bffc e804 e004 1080 0003 0100 0000 a810 2000 e827 bffc 10bf ffe5 0100 0000 9010 2000
0137260 b010 0008 81c7 e008 81e8 0000 033f ffff 8200 63a0 9de3 8001 1100 0124 9012 22e8 4000 b885 0100 0000 9010 2000 b010 0008
0137340 81c7 e008 81e8 0000 033f ffff 8200 63a0 9de3 8001 1100 0124 9012 22e8 9210 2002 4000 b87c 0100 0000 9010 2000 b010 0008
0137420 81c7 e008 81e8 0000 033f ffff 8200 63c0 9de3 8001 f027 a044 f227 a048 9010 2000 1080 0003 0100 0000 9010 2000 b010 0008
*
0137720 81c7 e008 81e8 0000 033f ffff 8200 63a0 9de3 8001 f227 a048 1100 0000 9012 2000 d207 a048 4000 b842 0100 0000 1300 00f7
0140000 9212 6045 4000 b83e 0100 0000 d006 2008 d202 0000 c202 600c d406 2008 d602 8000 d852 e008 9a10 000c d006 2008 9002 000d
0140060 1300 00f7 9212 6047 9fc0 4000 0100 0000 9010 2000 b010 0008 81c7 e008 81e8 0000 033f ffff 8200 63c0 9de3 8001 f027 a044
0140140 f227 a048 9010 3fff 1080 0003 0100 0000 9010 2000 b010 0008 81c7 e008 81e8 0000 033f ffff 8200 63a0 9de3 8001 f027 a044
0140220 f227 a048 d007 a044 d207 a048 4000 1916 0100 0000 1300 0126 d022 60c4 8090 0008 1280 0005 0100 0000 9010 3fff 1080 0006
0140300 0100 0000 9010 2000 1080 0003 0100 0000 9010 2000 b010 0008 81c7 e008 81e8 0000 033f ffff 8200 63a0 9de3 8001 1100 0126
0140360 d002 20c4 4000 b81d 0100 0000 80a2 3fff 1280 0005 0100 0000 9010 3fff 1080 0006 0100 0000 9010 2000 1080 0003 0100 0000
0140440 9010 2000 b010 0008 81c7 e008 81e8 0000 033f ffff 8200 6398 9de3 8001 f027 a044 f227 a048 f427 a04c f627 a050 1100 0123
0140520 d002 2318 8090 0008 0280 000c 0100 0000 1100 0123 d002 2318 1300 00f7 9212 62c9 4000 18e1 0100 0000 1300 00f7 d022 62bc
0140600 1080 0008 0100 0000 d007 a044 d207 a048 4000 18d9 0100 0000 1500 00f7 d022 a2bc 1700 00f7 d602 e2bc 8090 000b 1280 0005
0140660 0100 0000 9010 2000 1080 0080 0100 0000 9010 2400 4000 60ff 0100 0000 1900 0126 d023 2148 1b00 00f7 9a13 62cc 1f00 0123
0140740 da23 e32c c027 bffc e007 bffc 80a4 2084 1680 0016 0100 0000 d007 bffc 1300 0124 9212 62f4 9410 2020 d42a 0009 d607 bffc
0141020 1900 0124 9813 237c 9a10 2020 da2a c00c de07 bffc 2100 0125 a014 2004 a213 2020 e22b c010 e407 bffc a404 a001 e427 bffc
0141100 10bf ffea 0100 0000 2700 0125 c02c e08c 2900 0125 c02d 2118 4000 2c90 0100 0000 2b00 0124 d025 62f0 1100 0124 9012 22f4
0141160 1300 0124 d202 62f0 4000 0053 0100 0000 1100 0124 9012 231f 1300 00f7 9212 62cf 4000 004d 0100 0000 1100 0124 9012 236c
0141240 1300 00f7 9212 630e 4000 b78c 0100 0000 1100 0124 9012 237c 1300 00f7 9212 6315 4000 0041 0100 0000 1100 0124 9012 2381
0141320 d207 a050 4000 003c 0100 0000 d007 a04c 4000 b796 0100 0000 8090 0008 1680 0003 0100 0000 9002 2001 913a 2001 2f00 0124
0141400 ae15 e3be 9025 c008 d207 a04c 4000 002e 0100 0000 1100 0125 9012 207c 1300 00f7 9212 631b 4000 b76d 0100 0000 1100 0125
0141460 9012 2004 1300 00f7 9212 6322 4000 0022 0100 0000 c027 bffc f007 bffc 80a6 207c 1480 000c 0100 0000 f207 bffc 3500 0126
0141540 b416 a0c8 b610 2020 f62e 401a f807 bffc b807 2001 f827 bffc 10bf fff4 0100 0000 3b00 0126 c02f 6144 1100 0126 9012 2150
0141620 1300 0126 d022 6350 941c 2001 1700 00f7 d422 e280 1100 00f7 d002 22bc 1080 0003 0100 0000 9010 2000 b010 0008 81c7 e008
0141700 81e8 0000 033f ffff 8200 63c0 9de3 8001 f027 a044 f227 a048 d007 a048 d24a 0000 9410 0009 8090 000a 0280 000e 0100 0000
0141760 d607 a044 d807 a048 da4b 0000 da2a c000 de07 a048 9e03 e001 de27 a048 e007 a044 a004 2001 e027 a044 10bf fff0 0100 0000
0142040 1080 0003 0100 0000 9010 2000 b010 0008 81c7 e008 81e8 0000 033f ffff 8200 63a0 9de3 9001 4000 03e1 0100 0000 1100 00f7
```

```
0142120 d002 22bc 4000 b745 0100 0000 90a2 3fff 1290 0005 0100 0000 9010 3fff 1080 000c 0100 0000 1100 00f7 c022 22bc 1100 0126
0142200 d002 2149 4000 606f 0100 0000 9010 2000 1080 0003 0100 0000 9010 2000 b010 0008 81c7 e008 81e8 0000 033f ffff 8200 6398
0142260 9de3 8001 1100 00f7 d002 2290 90a2 3ffe 0280 000a 0100 0000 1100 00f7 d002 2290 d027 bffc 9210 3ffe 1500 00f7 d222 a290
0142340 1080 0021 0100 0000 1100 0126 d002 20c4 d202 0000 9222 6001 d222 0000 8090 0009 0680 000c 0100 0000 1500 0126 d402 a0c4
0142420 d602 a004 9602 e001 d622 a004 9822 e001 da0b 0000 9e10 000d 1080 0007 0100 0000 1100 0126 d002 20c4 4000 b718 0100 0000
0142500 9e10 0008 2100 00f7 de24 2290 de27 bffc 2300 00f7 e204 6298 a204 6001 2500 00f7 e224 a298 d007 bffc 1080 0003 0100 0000
0142560 9010 2000 b010 0008 81c7 e008 81e8 0000 033f ffff 8200 63c0 9de3 8001 1100 00f7 d002 2298 9002 2001 1300 00f7 d022 6298
0142640 9010 2000 b010 0008 81c7 e008 81e8 0000 033f ffff 8200 6398 9de3 8001 f027 a044 f227 a048 f427 a04c f627 a050 f827 a054
0142720 fa27 a058 1100 00f7 d04a 225c 9090 0008 0280 0007 0100 0000 1300 00f7 d202 62bc 8090 0009 1280 0004 0100 0000 1080 0031
0143000 0100 0000 9407 a044 d427 bffc d607 bffc 9602 e004 d627 bffc d802 fffc d827 bff8 1b00 00f7 da4b 62a4 8090 000d 0280 001e
0143060 0100 0000 1100 0126 d002 2350 1300 0126 9212 61d4 80a2 0009 0880 0006 0100 0000 1500 0126 9412 a150 1700 0126 d422 e350
0143140 1100 0126 d002 2350 d207 bff8 d407 bffc 4000 7b69 0100 0000 1100 0126 d002 2350 4000 b6ae 0100 0000 1900 0126 d803 2350
0143220 9803 0008 1b00 0126 d823 6350 1080 0008 0100 0000 1100 00f7 d002 22bc d207 bff8 d407 bffc 4000 79c0 0100 0000 9010 2000
0143300 b010 0008 81c7 e008 81e8 0000 033f ffff 8200 6398 9de3 8001 f027 a044 1100 00f7 d04a 225c 8090 0008 0280 0088 0100 0000
0143360 1100 00f7 d002 2280 8090 0008 0280 001f 0100 0000 4000 06ed 0100 0000 1100 00f7 d002 227c 9002 2001 1300 00f7 d022 627c
0143440 1500 00f7 d402 a27c 1700 00f7 d602 e28c 80a2 800b 0680 0004 0100 0000 4000 06df 0100 0000 9810 2001 1b00 0122 d823 6098
0143520 1100 00f7 9012 2328 1300 0123 d202 632c 1500 0122 d402 a098 7fff ff92 0100 0000 1f00 00f7 c023 e280 2100 00f7 e04c 22a4
0143600 8090 0010 0280 0018 0100 0000 1100 0126 d002 2350 1300 0126 9212 61d4 80a2 0009 0880 0006 0100 0000 1500 0126 9412 a150
0143660 1700 0126 d422 e350 1900 0126 d803 2350 da07 a044 da2b 0000 1f00 0126 de03 e350 9e03 e001 2100 0126 de24 2350 1080 004b
0143740 0100 0000 1100 00f7 d002 22bc d202 0000 9222 6001 d222 0000 8090 0009 0680 000e 0100 0000 1500 00f7 d402 a2bc d602 a004
0144020 9602 e001 d622 a004 9822 e001 da07 a044 9e05 60ff de2b 0000 a010 000f 1080 0037 0100 0000 2300 00f7 e204 62bc e454 6010
0144100 a610 0012 809c e080 0280 0029 0100 0000 2900 00f7 e805 22bc ea05 200c 2d00 00f7 ec05 a2bc ee05 8000 b020 0017 80a6 0015
0144160 1680 001f 0100 0000 3300 00f7 f206 62bc f406 6004 e007 a044 a00c 20ff e02e 8000 80a4 200a 0280 000b 0100 0000 3700 00f7
0144240 f606 e2bc f806 e004 b807 2001 f826 e004 ba27 2001 e00f 4000 1080 000b 0100 0000 1100 00f7 d002 22bc d202 2004 d00a 4000
0144320 1300 00f7 d202 62bc 4000 b633 0100 0000 a010 0008 1080 0009 0100 0000 d007 a044 900a 20ff 1300 00f7 d202 62bc 4000 b62a
0144400 0100 0000 a010 0008 d407 a044 80a2 a00a 1280 006f 0100 0000 1100 00f7 d04a 225c 8090 0008 0280 0044 0100 0000 1300 00f7
0144460 d202 6294 8090 0009 0480 003f 0100 0000 1100 00f7 d04a 22a4 8090 0008 0280 000d 0100 0000 1100 0126 d002 2350 c02a 0000
0144540 1100 00f7 d002 22bc 1300 00f7 9212 6331 1500 0126 9412 a150 4000 b5d5 0100 0000 4000 0269 0100 0000 c027 bffc 1300 00f7
0144620 d202 6294 8090 0009 0480 0027 0100 0000 1100 00f7 d002 227c 9002 2001 1300 00f7 d022 627c 1500 00f7 d402 a27c 1700 00f7
0144700 d602 e28c 90a2 800b 0680 0004 0100 0000 4000 063a 0100 0000 d807 bffc 9b2b 2002 1f00 0125 9e13 e1a0 d603 400f 1300 00f7
0144760 9212 6334 1100 00f7 d002 22bc 1500 0123 d402 a32c 4000 b5b2 0100 0000 2100 00f7 e004 2294 a024 2001 2300 00f7 e024 6294
0145040 e407 bffc a404 a001 e427 bffc 10bf ffd8 0100 0000 2700 0126 a614 e150 2900 0126 e625 2350 2b00 0122 ea05 6098 aa05 6001
0145120 2d00 0122 ea25 a098 2f00 00f7 c025 e298 3100 00f7 f04e 225c 8090 0018 0280 0018 0100 0000 1100 00f7 d002 227c 9002 2001
0145200 1300 00f7 d022 627c 1500 00f7 d402 a27c 1700 00f7 d602 e28c 80a2 800b 0680 0004 0100 0000 4000 0605 0100 0000 1100 00f7
0145260 9012 2339 1300 0123 d202 632c 1500 0122 d402 a098 7fff febb 0100 0000 9810 3ffe 1b00 00f7 d823 6290 d007 a044 912a 2018
0145340 913a 2018 1080 0003 0100 0000 9010 2000 b010 0008 81c7 e008 81e8 0000 033f ffff 8200 6398 9de3 8001 f02f a047 f227 a048
0145420 d007 a048 8090 0008 0280 0007 0100 0000 9210 3ffe 1500 00f7 d222 a290 1080 0072 0100 0000 1100 011e d002 22b4 9022 2001
0145500 1300 011e d022 62b4 8090 0009 0680 000e 0100 0000 1500 011e d402 a2b8 9402 a001 1700 011e d422 e2b8 9822 a001 da4f a047
0145560 9e0b 60ff de2b 0000 a010 000f 1080 0032 0100 0000 2300 011e e254 62c4 a410 0011 808c a080 0280 0025 0100 0000 2700 011e
0145640 e604 e2b4 a820 0013 2b00 011e ea05 62c0 80a5 0015 1680 001d 0100 0000 2d00 011e ec05 a2b8 e04f a047 a00c 20ff e02d 8000
0145720 80a4 200a 0280 000b 0100 0000 2f00 011e ee05 e2b8 ae05 e001 3100 011e ee26 22b8 b225 e001 ec0e 4000 1080 000a 0100 0000
0146000 3500 011e f406 a2b8 d00e 8000 1300 011e 9212 62b4 4000 b564 0100 0000 a010 0008 1080 0009 0100 0000 d04f a047 900a 20ff
0146060 1300 011e 9212 62b4 4000 b55b 0100 0000 a010 0008 f64f a047 b810 001b 80a7 200a 1280 0026 0100 0000 1100 00f7 d002 2294
0146140 8090 0008 0480 001f 0100 0000 4000 01ae 0100 0000 c027 bffc 1100 00f7 d002 2294 8090 0008 0480 0017 0100 0000 d007 bffc
0146220 932a 2002 1500 0125 9412 a1a0 d402 400a 1300 0123 d202 632c 1100 00f7 9012 2342 4000 b52b 0100 0000 1700 00f7 d602 e294
0146300 9622 e001 1900 00f7 d623 2294 da07 bffc 9a03 6001 da27 bffc 10bf ffe8 0100 0000 1f00 00f7 c023 e298 a010 3ffe 2300 00f7
0146360 e024 6290 9010 2000 b010 0008 81c7 e008 81e8 0000 033f ffff 8200 6398 9de3 8001 f027 a044 f227 a048 ba10 20fa f607 a044
0146440 1100 0126 d002 20c4 d202 0000 9222 6001 d222 0000 8090 0009 0680 000c 0100 0000 1500 0126 d402 a0c4 d602 a004 9602 e001
0146520 d622 a004 9822 e001 da0b 0000 9e10 000d 1080 0007 0100 0000 1100 0126 d002 20c4 4000 b50a 0100 0000 9e10 0008 b810 000f
0146600 80a7 3fff 1280 0004 0100 0000 1080 000d 0100 0000 f82e c000 b606 e001 80a7 200a 1280 0004 0100 0000 1080 0006 0100 0000
0146660 ba27 6001 8090 001d 16bf ffda 0100 0000 e207 a044 a426 c011 e427 bffc c02e c000 2700 00f7 e604 e2c0 8090 0013 0280 0005
0146740 0100 0000 9010 200a 7fff fe39 0100 0000 2900 00f7 e805 2280 8090 0014 0280 0005 0100 0000 9010 2020 7fff fe31 0100 0000
0147020 80a7 200a 1280 0005 0100 0000 aa10 2001 1080 0003 0100 0000 aa10 2000 2d00 00f7 ea25 a2c0 2f00 00f7 ee05 e2c0 8090 0017
0147100 0280 0003 0100 0000 c02e ffff 1100 00f7 9012 2347 d207 a044 7fff fdd6 0100 0000 3100 00f7 f006 22c0 8090 0018 0280 0004
0147160 0100 0000 b210 200a f22e ffff d007 bffc 1080 0003 0100 0000 9010 2000 b010 0008 81c7 e008 81e8 0000 033f ffff 8200 6398
```

```
0147240 9de3 8001 f027 a044 d007 a044 d24a 0000 9410 0009 8090 000a 0280 0059 0100 0000 1700 00f7 d602 e2bc d802 c000 9823 2001
0147320 d822 c000 8090 000c 0680 0012 0100 c000 1b00 00f7 da03 62bc de03 6004 9e03 e001 de23 6004 a023 e001 e207 a044 a204 6001
0147400 e227 a044 a424 6001 e64c 8000 a80c e0ff e82c 0000 aa10 0014 1080 003f 0100 0000 2d00 00f7 ec05 a2bc ee55 a010 b010 0017
0147460 808e 2080 0280 002d 0100 0000 3300 00f7 f206 62bc f406 600c 3700 00f7 f606 e2bc f806 c000 ba20 001c 80a7 401a 1680 0023
0147540 0100 0000 1100 00f7 d002 22bc d202 2004 d407 a044 9402 a001 d427 a044 9622 a001 ea4a c000 aa0d 60ff ea2a 4000 80a5 600a
0147620 0280 000b 0100 0000 1900 00f7 d803 22bc da03 2004 9a03 6001 da23 2004 9e23 6001 ea0b c000 1080 000b 0100 0000 2100 00f7
0147700 e004 22bc e204 2004 d00c 4000 1300 00f7 d202 62bc 4000 b474 0100 0000 aa10 0008 1080 000d 0100 0000 e407 a044 a404 a001
0147760 e427 a044 a624 a001 d04c c000 900a 20ff 1300 00f7 d202 62bc 4000 b467 0100 0000 aa10 0008 10bf ffa5 0100 0000 e807 a044
0150040 ea4d 3fff ac10 0015 80a5 a00a 0280 0004 0100 0000 1080 004c 0100 0000 2f00 00f7 ee05 e294 8090 c017 0480 c02f 0100 0000
0150120 4000 00b5 0100 0000 c027 bffc 1100 00f7 d002 2294 8090 0008 0480 0027 0100 0000 1100 00f7 d002 227c 9002 2001 1300 00f7
0150200 d022 627c 1500 00f7 d402 a27c 1700 00f7 d602 e28c 80a2 800b 0680 0004 0100 0000 4000 0486 0100 0000 d807 bffc 9b2b 2002
0150260 1f00 0125 9e13 e1a0 d603 400f 1300 00f7 9212 634a 1100 00f7 d002 22bc 1500 0123 d402 a32c 4000 b3fe 0100 0000 2100 00f7
0150340 e004 2294 a024 2001 2300 00f7 e024 6294 e407 bffc a404 a001 e427 bffc 10bf ffd8 0100 0000 2700 0122 e604 e098 a604 e001
0150420 2900 0122 e625 2098 2b00 00f7 c025 6298 1100 00f7 d002 227c 9002 2001 1300 00f7 d022 627c 1500 00f7 d402 a27c 1700 00f7
0150500 d602 e29c 80a2 800b 0680 0004 0100 0000 4000 045a 0100 0000 1080 0003 0100 0000 9010 2000 b010 0008 81c7 e008 81e8 0000
0150560 033f ffff 8200 6398 9de3 8001 f027 a044 f227 a048 1100 00f7 d04a 225c 9210 0008 808a 607f 0280 0046 0100 0000 1100 00f7
0150640 d002 22bc 8090 0008 0280 0035 0100 0000 c027 bffc d007 a044 d027 bff8 d207 bff8 d44a 4000 9610 000a 8090 000b 0280 0010
0150720 0100 0000 d807 bff8 da4b 0000 9e10 000d 80a3 e00a 1280 0005 0100 0000 e007 bffc a004 2001 e027 bffc e207 bff8 a204 6001
0151000 e227 bff8 10bf ffee 0100 0000 2500 00f7 e44c a254 8090 0012 1280 0011 0100 0000 d007 bffc 1300 00f7 d202 627c 9202 4008
0151060 1500 00f7 d222 a27c 1700 00f7 d602 e27c 1900 00f7 d803 228c 80a2 c00c 0680 0004 0100 0000 4000 0419 0100 0000 1100 00f7
0151140 d002 22bc d207 a044 d407 a048 4000 76d2 0100 0000 1080 000e 0100 0000 1100 011e 9012 22c8 d207 a044 d407 a048 4000 76ca
0151220 0100 0000 1100 011e 9012 22c8 1300 00f7 9212 634f 4000 b38a 0100 0000 9010 2000 b010 0008 81c7 e008 81e8 0000 033f ffff
0151300 9200 6398 9de3 8001 f027 a044 f227 a048 f427 a04c f627 a050 f827 a054 fa27 a058 9007 a044 d027 bffc d207 bffc 9202 6004
0151360 d227 bffc d402 7ffc d427 bff8 d007 bff8 d207 bffc 7fff ff9b 0100 0000 1080 0003 0100 0000 9010 2000 b010 0008 81c7 e008
0151440 81e8 0000 033f ffff 8200 6398 9de3 8001 1100 00f7 d002 22bc 1300 00f7 9212 6369 1500 0123 d402 a32c 1700 0126 9612 e0c8
0151520 4000 b35f 0100 0000 1100 00f7 d002 227c 9002 2001 1300 00f7 d022 627c c027 bffc d407 bffc 80a2 a07c 1480 000c 0100 0000
0151600 d607 bffc 1900 0126 9813 20c8 9a10 2020 da2a c00c de07 bffc 9e03 e001 de27 bffc 10bf fff4 0100 0000 2100 0126 c02c 2144
0151660 1080 0003 0100 0000 9010 2000 b010 0008 81c7 e008 81e8 0000 033f ffff 8200 6398 9de3 8001 1100 00f7 d002 22bc 1300 011e
0151740 9212 62b4 80a2 0009 1280 006a 0100 0000 7fff ffcd 0100 0000 c027 bffc 1100 00f7 d002 2294 8090 0008 0480 0019 0100 0000
0152020 d007 bffc 932a 2002 1500 0125 9412 a1a0 d602 400a 1300 00f7 9212 6375 1100 00f7 d002 22bc 1500 0123 d402 a32c 4000 b324
0152100 0100 0000 1700 00f7 d602 e294 9622 e001 1900 00f7 d623 2294 da07 bffc 9a03 6001 da27 bffc 10bf ffe6 0100 0000 1f00 00f7
0152160 de03 e2bc e003 c000 a024 2001 e023 c000 8090 0010 0690 000d 0100 0000 2300 00f7 e204 62bc e404 6004 a404 a001 e424 6004
0152240 a624 a001 a810 200a e82c c000 aa10 0014 1080 0035 0100 0000 2d00 00f7 ec05 a2bc ee55 a010 b010 0017 808e 2080 0280 0028
0152320 0100 0000 3300 00f7 f206 62bc f406 600c 3700 00f7 f606 e2bc f806 c000 ba20 001c 80a7 401a 1680 001e 0100 0000 1100 00f7
0152400 d002 22bc d202 2004 aa10 200a ea2a 4000 90a5 600a 0280 000b 0100 0000 1500 00f7 d402 a2bc d602 a004 9602 e001 d622 a004
0152460 9822 e001 ea0b 0000 1080 000b 0100 0000 1b00 00f7 da03 62bc de03 6004 d00b c000 1300 00f7 d202 62bc 4000 b313 0100 0000
0152540 aa10 0008 1080 0008 0100 0009 9010 200a 1300 00f7 d202 62bc 4000 b30b 0100 0000 aa10 0008 9010 2000 1080 00ab 0100 0000
0152620 2100 00f7 e04c 225c a210 0010 808c 607f 0280 0048 0100 0000 2500 00f7 e404 a294 8090 0012 0480 0043 0100 0000 7fff ff5a
0152700 0100 0000 c027 bffc 1100 00f7 d002 2294 8090 0008 0480 003b 0100 0000 1100 00f7 d002 22bc 8090 0008 0280 001f 0100 0000
0152760 1100 00f7 d002 227c 9002 2001 1300 00f7 d022 627c 1500 00f7 d402 a27c 1700 00f7 d602 e28c 80a2 800b 0680 0004 0100 0000
0153040 4000 0326 0100 0000 d807 bffc 9b2b 2002 1f00 0125 9e13 e1a0 d603 400f 1300 00f7 9212 637a 1100 00f7 d002 22bc 1500 0123
0153120 d402 a32c 4000 b29e 0100 0000 1080 000f 0100 0000 e007 bffc a32c 2002 2500 0125 a414 a1a0 d604 4012 1300 00f7 9212 637f
0153200 1100 011e 9012 22c8 1500 0123 d402 a32c 4000 b28f 0100 0000 2700 00f7 e604 e294 a624 e001 2900 00f7 e625 2294 ea07 bffc
0153260 aa05 6001 ea27 bffc 10bf ffc4 0100 0000 2d00 00f7 ec4d a25c ae10 0016 808d e07f 0280 0055 0100 0000 3100 00f7 f006 22bc
0153340 8090 0018 0280 004a 0100 0000 3300 00f7 f206 62bc f406 4000 b426 a001 f426 4000 8090 001a 0680 000d 0100 0000 3700 00f7
0153420 f606 e2bc f806 e004 b807 2001 f826 e004 ba27 2001 9010 200a d02f 4000 9210 0008 1080 0035 0100 0000 1500 00f7 d402 a2bc
0153500 d652 a010 9810 c00b 808b 2080 0280 0028 0100 0000 1b00 00f7 da03 62bc de03 600c 2100 00f7 e004 22bc e204 0000 a420 0011
0153560 80a4 800f 1680 001e 0100 0000 2700 00f7 e604 e2bc e804 e004 9210 200a d22d 0000 80a2 600a 0280 000b 0100 0000 2b00 00f7
0153640 ea05 62bc ec05 6004 ac05 a001 ec25 6004 ae25 a001 d20d c000 1080 000b 0100 0000 3100 00f7 f006 22bc f206 2004 d00e 4000
0153720 1300 00f7 d202 62bc 400c b273 0100 0000 9210 0008 1080 0008 0100 0000 9010 200a 1300 00f7 d202 62bc 4000 b26b 0100 0000
0154000 9210 0008 1080 0008 0100 0000 1100 011e 9012 22c8 1300 00f7 9212 6384 4000 b22c 0100 0000 9010 2000 1080 0003 0100 0000
0154060 9010 2000 b010 0008 81c7 e008 81e8 0000 033f ffff 8200 63c0 9de3 8001 f02f a047 1080 0025 0100 0000 1100 0123 d002 2328
0154140 9002 2001 1300 0123 d022 6328 9010 2000 1080 0028 0100 0000 1500 0122 d402 a09c 9402 a001 1700 0122 d422 e09c 1100 00f7
0154220 d04a 2260 1080 001f 0100 0000 1900 0123 d803 2308 9803 2001 1b00 0123 d823 6308 1100 00f7 d04a 2268 1080 0016 0100 0000
0154300 1f00 0123 de03 e324 9e03 e001 2100 0123 de24 2324 1100 00f7 d04a 2264 1080 000d 0100 0000 d04f a047 80a2 2049 02bf ffdb
```

| | | | | | | | | | | | | | | | | | | | | | | | | |
|---|---|---|---|---|---|---|---|---|---|---|---|---|---|---|---|---|---|---|---|---|---|---|---|---|
| 0154360 | 80a2 | 2053 | 02bf | ffea | 80a2 | 2057 | 02bf | ffdf | 0100 | 0000 | 10bf | ffef | 0100 | 0000 | 9010 | 2000 | b010 | 0008 | 81c7 | e008 | 81e8 | 0000 | 033f | fffe |
| 0154440 | 8200 | 6398 | 9de3 | 8001 | f027 | a044 | f227 | a048 | f427 | a04c | f627 | a050 | 1100 | 00f7 | d002 | 22bc | 1300 | 011e | 9212 | 62b4 | 80a2 | 0009 | 0280 | 001a |
| 0154520 | 0100 | 0000 | 1100 | 00f7 | d002 | 2298 | 8090 | 0006 | 1280 | 0005 | 0100 | 0000 | 9210 | 2021 | 1500 | 0126 | d22a | a0c8 | 1700 | 00f7 | d602 | e298 | 8090 | 000b |
| 0154600 | 0480 | 000d | 0100 | 0000 | 1900 | 00f7 | d803 | 2298 | 80a3 | 207c | 1680 | 0008 | 0100 | 0000 | 1b00 | 00f7 | da03 | 6298 | 1f00 | 0126 | 9e13 | e0c7 | a010 | 2021 |
| 0154660 | e02b | 400f | d007 | a048 | 7fff | ffa2 | 0100 | 0000 | d027 | bbfc | e207 | bbfc | 808c | 607f | 0280 | 0054 | 0100 | 0000 | 2500 | 00f7 | e404 | a2bc | 2700 | 011e |
| 0154740 | a614 | e2b4 | 80a4 | 8013 | 0280 | 004d | 0100 | 0000 | 1100 | 00f7 | 9012 | 239e | d207 | a048 | d407 | a044 | 4000 | b1d7 | 0100 | 0000 | d007 | a04c | d207 | a050 |
| 0155020 | 4000 | 74d8 | 0100 | 0000 | 1100 | 011e | d002 | 22b4 | 9022 | 2001 | 1300 | 011e | d022 | 62b4 | 8090 | 0008 | 0680 | 000d | 0100 | 0000 | 1500 | 011e | d402 | a2b8 |
| 0155100 | 9402 | a001 | 1700 | 011e | d422 | e2b8 | 9822 | a001 | 9a10 | 200a | da2b | 0000 | 9e10 | 000d | 1080 | 0030 | 0100 | 0000 | 2100 | 011e | e054 | 22c4 | a210 | 0010 |
| 0155160 | 808c | 6080 | 0280 | 0024 | 0100 | 0000 | 2500 | 011e | e404 | a2b4 | a620 | 0012 | 2900 | 011e | e805 | 22c0 | 80a4 | c014 | 1680 | 001c | 0100 | 0000 | 2b00 | 011e |
| 0155240 | ea05 | 62b8 | 9e10 | 200a | de2d | 4000 | 80a3 | e00a | 0280 | 000b | 0100 | 0000 | 2d00 | 011e | ec05 | a2b8 | ac05 | a001 | 2f00 | 011e | ec25 | e2b8 | b025 | a001 |
| 0155320 | de0e | 0000 | 1080 | 000a | 0100 | 0000 | 3300 | 011e | f206 | 62b8 | d00e | 4000 | 1300 | 011e | 9212 | 62b4 | 4000 | b1ad | 0100 | 0000 | 9e10 | 0008 | 1080 | 0008 |
| 0155400 | 0100 | 0000 | 9010 | 200a | 1300 | 011e | 9212 | 62b4 | 4000 | b1a5 | 0100 | 0000 | 9e10 | 0008 | 9027 | a200 | 1300 | 00f7 | 9212 | 63ac | d407 | a048 | d607 | a044 |
| 0155460 | 4000 | b161 | 0100 | 0000 | 9027 | a400 | d207 | a04c | d407 | a050 | 4000 | 7634 | 0100 | 0000 | 9027 | a400 | 1300 | 00f7 | 9212 | 63ba | 4000 | b17e | 0100 | 0000 |
| 0155540 | 9027 | a200 | 9227 | a400 | 9410 | 21ff | 4000 | b191 | 0100 | 0000 | 4000 | 0103 | 0100 | 0000 | 1080 | 0003 | 0100 | 0000 | 9010 | 2000 | b010 | 0008 | 81c7 | e008 |
| 0155620 | 81e8 | 0000 | 033f | ffff | 8200 | 6390 | 9de3 | 8001 | f027 | a044 | f227 | a048 | f427 | a04c | f627 | a050 | f827 | a054 | fa27 | a058 | 9007 | a044 | d027 | bffc |
| 0155700 | d207 | bffc | 9202 | 6004 | d227 | bffc | d402 | 7ffc | d427 | bff8 | d607 | bffc | 9602 | e004 | d627 | bffc | d802 | fffc | d827 | bff4 | da07 | bffc | 9a03 | 6004 |
| 0155760 | da27 | bffc | de03 | 7ffc | de27 | bff0 | d007 | bff8 | d207 | bff4 | d407 | bff0 | d607 | bffc | 7fff | ff44 | 0100 | 0000 | 1080 | 0003 | 0100 | 0000 | 9010 | 2000 |
| 0156040 | b010 | 0008 | 81c7 | e008 | 81e8 | 0000 | 033f | ffff | 8200 | 6398 | 9de3 | 8001 | f027 | a044 | f227 | a048 | f427 | a04c | f627 | a050 | d007 | a048 | 7fff | fefd |
| 0156120 | 0100 | 0000 | d027 | bffc | 1100 | 00f7 | d04a | 225c | 9210 | 0008 | 808a | 607f | 0280 | 0044 | 0100 | 0000 | 1100 | 00f7 | d002 | 22bc | 8090 | 0008 | 0280 | 0027 |
| 0156200 | 0100 | 0000 | 1100 | 00f7 | d002 | 22bc | 1300 | 011e | 9212 | 62b4 | 80a2 | 0009 | 0280 | 001e | 0100 | 0000 | 1100 | 00f7 | d002 | 227c | 9002 | 2002 | 1300 | 00f7 |
| 0156260 | d022 | 627c | 1500 | 00f7 | d402 | a27c | 1700 | 00f7 | d602 | e28c | 80a2 | 800b | 0680 | 0004 | 0100 | 0000 | 4000 | 017a | 0100 | 0000 | 1100 | 00f7 | 9012 | 23bc |
| 0156340 | d207 | a048 | d407 | a044 | 7fff | fd75 | 0100 | 0000 | d007 | a04c | d207 | a050 | 7fff | fd1e | 0100 | 0000 | 1100 | 00f7 | 9012 | 23cb | 7fff | f16d | 0100 | 0000 |
| 0156420 | 1080 | 001a | 0100 | 0000 | d807 | a048 | 80a3 | 2049 | 0280 | 0016 | 0100 | 0000 | 1100 | 011e | 9012 | 22c8 | 1300 | 00f7 | 9212 | 63cd | d407 | a048 | d607 | a044 |
| 0156500 | 4000 | b0e3 | 0100 | 0000 | 1100 | 011e | 9012 | 22c8 | d207 | a04c | d407 | a050 | 4000 | 7417 | 0100 | 0000 | 1100 | 011e | 9012 | 22c8 | 1300 | 00f7 | 9212 | 63dc |
| 0156560 | 4000 | b0d7 | 0100 | 0000 | d007 | bffc | 808a | 207f | 1280 | 0009 | 0100 | 0000 | 1300 | 00f7 | d202 | 62bc | 1500 | 011e | 9412 | a2b4 | 80a2 | 400a | 1280 | 004d |
| 0156640 | 0100 | 0000 | 1100 | 00f7 | 9012 | 23f6 | d207 | a048 | d407 | a044 | 4000 | b0ea | 0100 | 0000 | d007 | a04c | d207 | a050 | 4000 | 73eb | 0100 | 0000 | 1100 | 011e |
| 0156720 | d002 | 22b4 | 9022 | 2001 | 1300 | 011e | d022 | 62b4 | 8090 | 0008 | 0680 | 000d | 0100 | 0000 | 1500 | 011e | d402 | a2b8 | 9402 | a001 | 1700 | 011e | d422 | e2b8 |
| 0157000 | 9822 | a001 | 9a10 | 200a | da2b | 0000 | 9e10 | 000d | 1080 | 0030 | 0100 | 0000 | 2100 | 011e | e054 | 22c4 | a210 | 0010 | 808c | 6080 | 0280 | 0024 | 0100 | 0000 |
| 0157060 | 2500 | 011e | e404 | a2b4 | a620 | 0012 | 2900 | 011e | e805 | 22c0 | 80a4 | c014 | 1680 | 001c | 0100 | 0000 | 2b00 | 011e | ea05 | 62b8 | 9e10 | 200a | de2d | 4000 |
| 0157140 | 80a3 | e00a | 0280 | 000b | 0100 | 0000 | 2d00 | 011e | ec05 | a2b8 | ac05 | a001 | 2f00 | 011e | ec25 | e2b8 | b025 | a001 | de0e | 0000 | 1080 | 000a | 0100 | 0000 |
| 0157220 | 3300 | 011e | f206 | 62b8 | d00e | 4000 | 1300 | 011e | 9212 | 62b4 | 4000 | b0c0 | 0100 | 0000 | 9e10 | 0008 | 1080 | 0008 | 0100 | 0000 | 9010 | 200a | 1300 | 011e |
| 0157300 | 9212 | 62b4 | 4000 | b0b8 | 0100 | 0000 | 9e10 | 0008 | 1080 | 0003 | 0100 | 0000 | 9010 | 2000 | b010 | 0008 | 81c7 | e008 | 81e8 | 0000 | 033f | ffff | 8200 | 6390 |
| 0157360 | 9de3 | 8001 | f027 | a044 | f227 | a048 | f427 | a04c | f627 | a050 | f827 | a054 | fa27 | a058 | 9007 | a044 | d027 | bffc | d207 | bffc | 9202 | 6004 | d227 | bffc |
| 0157440 | d402 | 7ffc | d427 | bff8 | d607 | bffc | 9602 | e004 | d627 | bffc | d802 | fffc | d827 | bff4 | da07 | bffc | 9a03 | 6004 | da27 | bffc | de03 | 7ffc | de27 | bff0 |
| 0157520 | d007 | bff8 | d207 | bff4 | d407 | bff0 | d607 | bffc | 7fff | ff33 | 0100 | 0000 | 1080 | 0003 | 0100 | 0000 | 9010 | 2000 | b010 | 0008 | 81c7 | e008 | 81e8 | 0000 |
| 0157600 | 033f | ffff | 8200 | 63a0 | 9de3 | 8001 | f027 | a044 | 1100 | 00f7 | d04a | 225c | 9210 | 0008 | 808a | 607f | 0280 | 0038 | 0100 | 0000 | 1100 | 00f7 | d002 | 2294 |
| 0157660 | 80a2 | 20c8 | 1280 | 0004 | 0100 | 0000 | 1080 | 0034 | 0100 | 0000 | 1300 | 00f7 | d202 | 6294 | 80a2 | 60c7 | 1280 | 0011 | 0100 | 0000 | 1100 | 00f7 | d002 | 2294 |
| 0157740 | 932a | 2002 | 1500 | 0125 | 9412 | a1a0 | 1700 | 00f8 | 9612 | e004 | d622 | 400a | 1900 | 00f7 | d803 | 2294 | 9803 | 2001 | 1b00 | 00f7 | d823 | 6294 | 1080 | 001d |
| 0160020 | 0100 | 0000 | d007 | a044 | 4000 | b048 | 0100 | 0000 | 9002 | 2001 | 1300 | 0126 | d202 | 6149 | 4000 | 59b9 | 0100 | 0000 | 1300 | 00f7 | d202 | 6294 | 952a | 6002 |
| 0160100 | 1700 | 0125 | 9612 | e1a0 | d022 | 800b | 1900 | 00f7 | d803 | 2294 | 9803 | 2001 | 1b00 | 00f7 | d823 | 6294 | 9e23 | 2001 | a12b | e002 | 2300 | 0125 | a214 | 61a0 |
| 0160160 | d004 | 0011 | d207 | a044 | 4000 | b018 | 0100 | 0000 | 1080 | 0003 | 0100 | 0000 | 9010 | 2000 | b010 | 0008 | 81c7 | e008 | 81e8 | 0000 | 033f | ffff | 8200 | 63c0 |
| 0160240 | 9de3 | 8001 | f027 | a044 | d007 | a044 | 1300 | 00f7 | d202 | 627c | 9202 | 4008 | 1500 | 00f7 | d222 | a27c | 1700 | 00f7 | d602 | e27c | 1900 | 00f7 | d803 | 228c |
| 0160320 | 80a2 | c00c | 0680 | 0004 | 0100 | 0000 | 400c | 0077 | 0100 | 0000 | 9010 | 2000 | b010 | 0008 | 81c7 | e008 | 81e8 | 0000 | 033f | ffff | 8200 | 6398 | 9de3 | 8001 |
| 0160400 | f027 | a044 | f227 | a048 | 1100 | 00f7 | d002 | 2288 | 8090 | 0008 | 1280 | 0008 | 0100 | 0000 | 1300 | 00f7 | d202 | 6284 | 1500 | 00f7 | d222 | a288 | 1080 | 0010 |
| 0160460 | 0100 | 0000 | 1100 | 00f7 | d002 | 2284 | 1300 | 00f7 | d202 | 6288 | 941a | 0009 | 808a | a001 | 0280 | 0004 | 0100 | 0000 | 4000 | 0059 | 0100 | 0000 | 1700 | 00f7 |
| 0160540 | d602 | e288 | 1900 | 00f7 | d623 | 2284 | 1b00 | 0124 | 9a13 | 637c | 1f00 | 0126 | da23 | e14c | e007 | a048 | 8090 | 0010 | 0280 | 001e | 0100 | 0000 | 1100 | 0126 |
| 0160620 | d002 | 214c | 9202 | 2005 | d227 | bffc | c027 | bff8 | d407 | bff8 | 80a2 | a010 | 1680 | 000d | 0100 | 0000 | d607 | bffc | 9810 | 2020 | d82a | c000 | da07 | bffc |
| 0160700 | 9a03 | 6001 | da27 | bffc | de07 | bff8 | 9e03 | e001 | de27 | bff8 | 10bf | fff3 | 0100 | 0000 | 2100 | 0126 | e004 | 214c | a204 | 2005 | e227 | bffc | d007 | bffc |
| 0160760 | d207 | a048 | 7fff | f874 | 0100 | 0000 | 1100 | 0126 | d002 | 214c | 9002 | 2076 | 1300 | 00f8 | 9212 | 6022 | d407 | a044 | 4000 | afa8 | 0100 | 0000 | 2500 | 0126 |
| 0161040 | e404 | a14c | 2700 | 0124 | a614 | e37c | 80a4 | 8013 | 1280 | 0019 | 0100 | 0000 | 2900 | 0124 | a815 | 23f3 | e827 | bffc | ea07 | bffc | 2d00 | 0124 | ac15 | a37c |
| 0161120 | 80a5 | 4016 | 0a80 | 0010 | 0100 | 0000 | ea07 | bffc | f04d | c000 | b210 | 0018 | 8090 | 0019 | 1280 | 0005 | 0100 | 0000 | f407 | bffc | b610 | 2020 | f62e | 8000 |
| 0161200 | f807 | bffc | b827 | 2001 | f827 | bffc | 10bf | ffee | 0100 | 0000 | ba10 | 2033 | 1100 | 00f7 | fa22 | 227c | 1080 | 0003 | 0100 | 0000 | 9010 | 2000 | b010 | 0008 |
| 0161260 | 81c7 | e008 | 81e8 | 0000 | 033f | ffff | 8200 | 6398 | 9de3 | 8001 | 1100 | 00f7 | d002 | 2294 | 9002 | 2001 | 1300 | 00f7 | d022 | 6284 | 1500 | 00f7 | d44a | a254 |
| 0161340 | 8090 | 000a | 0280 | 0009 | 0100 | 0000 | 1700 | 0123 | d652 | e320 | 9602 | e001 | 972a | e010 | 973a | e010 | 1900 | 0123 | d633 | 2320 | 1b00 | 00f7 | da4b | 625c |
| 0161420 | 8090 | 000d | 0280 | 0153 | 0100 | 0000 | 1f00 | 00f7 | de03 | e2bc | 8090 | 000f | 0280 | 014e | 0100 | 0000 | 1100 | 0125 | d04a | 2118 | 9210 | 0008 | 8090 | 0009 |

```
0161500  0280 000f 0100 0000 1500 00f7 d44a a2a4 8090 000a 1280 000a 0100 0000 1100 00f7 d002 22bc 1300 00f8 9212 602d 1500 0125
0161560  9412 a118 4000 af56 0100 0000 4000 07fb 0100 0000 8090 0008 1280 0008 0100 0000 1700 0123 d652 e320 9810 000b 80a3 2001
0161640  1280 0093 0100 0000 1b00 00f7 da4b 62a4 8090 000d 1280 008e 0100 0000 1100 00f7 d002 22bc d202 0000 9222 6001 d222 0000
0161720  8090 0003 0680 000d 0100 0000 1500 00f7 d402 a2bc d602 a004 9602 e001 d622 a004 9822 e001 9a10 200c da2b 0000 9e10 000d
0162000  1080 0035 0100 0000 2100 00f7 e004 22bc e254 2010 a410 0011 808c a080 0280 0028 0100 0000 2700 00f7 e604 e2bc e804 e00c
0162060  2b00 00f7 ea05 62bc ec05 4000 ae20 0016 80a5 c014 1690 001e 0100 0000 3100 00f7 f006 22bc f206 2004 9e10 200c de2e 4000
0162140  30a3 e00a 0280 000b 0100 0000 3500 00f7 f406 a2bc f606 a004 b606 e001 f626 a004 b826 e001 de0f 0000 1080 000b 0100 0000
0162220  3b00 00f7 fa07 62bc d007 6004 d00a 0000 1300 00f7 d202 62bc 4000 af3f 0100 0000 9e10 0008 1080 0008 0100 0000 9010 200c
0162300  1300 00f7 d202 62bc 4000 af37 0100 0000 9e10 0008 1300 00f7 d202 62bc d402 4000 9422 a001 d422 4000 8090 000a 0680 000d
0162360  0100 0000 1700 00f7 d602 e2bc d802 e004 9803 2001 d822 e004 9a23 2001 9e10 200a de2b 4000 a010 000f 1080 0035 0100 0000
0162440  2300 00f7 e204 62bc e454 6010 a610 0012 308c e080 0280 0028 0100 0000 2900 00f7 e805 22bc ea05 200c 2d00 00f7 ec05 a2bc
0162520  ee05 8000 b020 0017 80a6 0015 1680 001e 0100 0000 3300 00f7 f206 62bc f406 6004 a010 200a e02e 8000 80a4 200a 0280 000b
0162600  0100 0000 3700 00f7 f606 e2bc f806 e004 b807 2001 f826 e004 ba27 2001 e00f 4000 1080 000b 0100 0000 1100 00f7 d002 22bc
0162660  1202 2004 d00a 4000 1300 00f7 d202 62bc 4000 aef9 0100 0000 a010 0008 1080 0008 0100 0000 9010 200a 1300 00f7 d202 62bc
0162740  4000 aef1 0100 0000 a010 0008 1500 00f7 d44a a254 8090 000a 0280 001d 0100 0000 1080 0014 0100 0000 9010 3ffe 1300 00f7
0163020  d032 6258 1080 0016 0100 0000 9410 2002 1700 00f7 d422 e27c 1900 0123 d853 2320 9a10 000c 80a3 6001 1280 0004 0100 0000
0163100  1080 000b 0100 0000 1080 0089 0100 0000 1100 00f7 d052 2258 80a2 3ffe 02bf fff0 80a2 3fff 02bf ffe9 0100 0000 1f00 00f7
0163160  de4b e254 8090 000f 0280 000d 0100 0000 4000 073a 0100 0000 8090 0008 1280 0008 0100 0000 2100 0123 e054 2320 a210 0010
0163240  80a4 6001 1280 006c 0100 0000 2500 00f7 e44c a2a4 8090 0012 1280 0067 0100 0000 1100 00f7 d002 22bc 1300 00f8 9212 6032
0163320  1500 0124 9412 a2f4 1700 00f7 d602 e284 1900 0124 9813 237c 4000 ae79 0100 0000 9010 2084 d027 bffc d207 bffc 8090 0009
0163400  0480 004d 0100 0000 1500 00f7 d402 a2bc d602 8000 9622 e001 d622 8000 8090 000b 0680 000d 0100 0000 1900 00f7 d803 22bc
0163460  1a03 2004 9a03 6001 da23 2004 9e23 6001 a010 202d e02b c000 a210 0013 1080 0035 0100 0000 2500 00f7 e404 a2bc e654 a010
0163540  a910 0013 80d4 2080 0280 0028 0100 0000 2b00 00f7 ea05 62bc ec05 600c 2f00 00f7 ee05 e2bc f005 c000 b220 0018 80a6 4016
0163620  1680 001e 0100 0000 3500 00f7 f406 a2bc f606 a004 a210 202d e22e c000 80a4 600a 0280 000b 0100 0000 3900 00f7 f807 22bc
0163700  fa07 2004 ba07 6001 fa27 2004 9027 6001 e20a 0000 1080 000b 0100 0000 1300 00f7 d202 62bc d402 6004 d00a 8000 1300 00f7
0163760  d202 62bc 4000 ae6c 0100 0000 a210 0008 1080 0009 0100 0000 9010 202d 1300 00f7 d202 62bc 4000 ae64 0100 0000 a210 0008
0164040  d607 bffc 9622 e001 d627 bffc 10bf ffb3 0100 0000 1100 00f7 d002 22bc 1300 00f8 9212 603b 1500 0125 9412 a08c 4000 ae20
0164120  0100 0000 9810 2002 1b00 00f7 d823 627c 1080 0003 0100 0000 9010 2000 b010 0008 81c7 e008 81e8 0000 033f ffff 8200 6398
0164200  9de3 8001 f027 a044 c027 bffc d007 bffc 80a2 2084 1680 000c 0100 0000 d207 bffc 1500 0125 9412 a08c 9610 2020 d62a 400a
0164260  d807 bffc 9803 2001 d827 bffc 10bf fff4 0100 0000 1b00 0125 c02b 6110 d007 a044 4000 ae1a 0100 0000 9e10 2084 9023 c008
0164340  8090 0008 1680 0003 0100 0000 9002 2001 913a 2001 2300 0125 a214 608c 9002 0011 d207 a044 4000 adf5 0100 0000 a410 2032
0164420  2700 00f7 e424 e27c 1080 0003 0100 0000 9010 2000 b010 0008 81c7 e008 81e8 0000 033f ffff 8200 6398 9de3 8001 f027 a044
0164500  f227 a048 c027 bffc d007 a048 8090 0008 0480 002c 0100 0000 d207 a048 80a2 6050 1680 0010 0100 0000 d207 a044 d007 bffc
0164560  9202 4008 1100 00f8 9012 2041 7fff fa50 0100 0000 d207 a048 9402 6001 1700 0126 d432 e364 c027 a048 1080 0018 0100 0000
0164640  d207 a044 d007 bffc 9202 4009 1100 0126 9012 2368 9410 204f 4000 ae01 0100 0000 1300 0126 c02a 63b7 1100 00f8 9012 2046
0164720  1300 0126 9212 6368 7fff fa39 0100 0000 d407 a048 9622 a04f d627 a049 d807 bffc 9a03 204f da27 bffc 10bf ffd4 0100 0000
0165000  9010 2000 b010 0008 81c7 e008 81e8 0000 033f ffff 8200 6398 9de3 8001 f027 a044 d007 a044 4000 adc5 0100 0000 d037 bffe
0165060  1100 0126 c02a 2368 1300 0126 d252 6364 9410 0009 8090 000a 0480 0009 0100 0000 1700 0126 d652 e364 1900 00f7 d853 22b8
0165140  80a2 c00c 0680 0008 0100 0000 d257 bffe 1007 a044 7fff ffaf 0100 0000 1080 004f 0100 0000 c037 bffa d057 bffa 9210 0008
0165220  90a2 6003 1680 0016 0100 0000 d457 bffa 9610 000a 992a e001 1b00 00f7 9a13 62b4 de53 000d 2100 0126 e054 2364 80a4 000f
0165300  1680 0004 0100 0000 1080 0009 0100 0000 e257 bffa a204 6001 a32c 6010 a33c 6010 e237 bffa 10bf ffe9 0100 0000 e457 bffa
0165360  a610 0012 a92c e001 2b00 00f7 aa15 62b4 ec55 0015 ae10 0016 3100 0126 f056 2364 b210 0018 b425 c019 f437 bffc d457 bffc
0165440  1300 00f8 9212 624a 1100 0126 9012 2368 4000 ad61 0100 0000 f657 bffa b810 001b bb2f 2001 1100 00f7 9012 22b4 d257 4008
0165520  9410 0009 d657 bffe 9810 000b 9a02 800c 9e03 6001 2100 0126 de34 2364 2300 0126 e254 6364 a410 0011 80a4 a050 0680 0000
0165600  0100 0000 d257 bffe d007 a044 7fff ff69 0100 0000 1080 0009 0100 0000 1100 0126 9012 2368 1300 00f8 9212 6054 d407 a044
0165660  7fff f9c3 0100 0000 9010 2000 b010 0008 81c7 e008 81e8 0000 033f ffff 8200 63c0 9de3 8001 1100 0126 c032 2364 9010 2000
0165740  b010 0008 81c7 e008 81e8 0000 033f ffff 8200 6398 9de3 8001 f027 a044 7fff f9f3 0100 0000 9010 202f 1300 00f7 d022 628c
0166020  c027 bffc d407 bffc 80a2 a084 1680 000c 0100 0000 d607 bffc 1900 0125 9813 2118 9a10 2020 da2a c00c de07 bffc 9e03 e001
0166100  de27 bffc 10bf fff4 0100 0000 2100 0125 c02c 219c d007 a044 4000 ad39 0100 0000 a210 2084 9024 4008 8090 0008 1680 0003
0166160  0100 0000 9002 2001 913a 2001 2700 0125 a614 e118 9002 0013 d207 a044 4000 ad13 0100 0000 1080 0003 0100 0000 9010 2000
0166240  b010 0008 81c7 e008 81e8 0000 033f ffff 8200 6388 9de3 8001 f02f a047 1100 00f7 d002 224c 8090 0008 0280 0035 0100 0000
0166320  9027 a008 1300 00f8 9212 6056 1500 0123 d402 a310 4000 acf4 0100 0000 9027 a010 1300 00f8 9212 605a 1500 0123 d402 a30c
0166400  4000 aced 0100 0000 9027 a018 1300 00f8 9212 605e 1500 0123 d402 a31c 4000 ace6 0100 0000 9427 a008 d84f a047 1300 00f8
0166460  9212 606e 1100 00f8 9012 2062 1700 00f8 9612 e077 4000 0d65 0100 0000 9427 a010 d84f a047 1300 00f8 9212 6084 1100 00f8
0166540  9012 2078 1700 00f8 9612 e08b 4000 0d5b 0100 0000 9427 a018 d84f a047 1300 00f8 9212 6098 1100 00f8 9012 208c 1700 00f8
```

```
0166620  9612 e0a7 4000 0451 0100 0000 9010 2000 b010 0008 81c7 e008 81e8 0000 033f ffff 8200 63a0 9de3 8001 1100 0122 d002 209c
0166700  8090 0008 1480 000c 0100 0000 1300 0123 d202 6324 8090 0009 1480 0007 0100 0000 1500 0123 d402 a308 8090 000a 0480 0027
0166760  0100 0000 1100 00f4 9012 20a8 1300 0122 d202 609c 1500 0123 d402 a324 1700 0123 d602 e308 4000 acd2 0100 0000 1100 0122
0167040  1002 209c 1300 0123 d202 6310 9202 4008 1500 0123 d222 a310 1700 0123 d602 e324 1900 0123 d803 230c 9803 000b 1b00 0123
0167120  d923 630c 1f00 0123 de03 e308 2100 0123 e004 231c a004 000f 2300 0123 e024 631c 2500 0122 c024 a09c 2700 0123 c024 e324
0167200  2900 0123 c025 2308 9010 2000 b010 0008 81c7 e008 81e8 0000 033f ffff 8200 63a0 9de3 8001 1100 00f7 d002 22bc 1300 011e
0167260  9212 62b4 80a2 0009 1280 0007 0100 0000 7fff ffbb 0100 0000 9010 2000 1080 00a0 0100 0000 1100 0122 d002 209c 8090 0008
0167340  1480 000c 0100 0000 1300 0123 d202 6324 8090 0009 1480 0007 0100 0000 1500 0123 d402 a308 8090 000a 0480 006d 0100 0000
0167420  1100 00f8 9012 20d6 1300 0122 d202 609c 1500 0123 d402 a324 1700 0123 d602 e308 4000 ac8b 0100 0000 1100 00f7 d04a 225c
0167500  9210 0008 808a 607f 0280 0042 0100 0000 1500 00f7 d402 a2bc 8090 000a 0280 003d 0100 0000 1100 00f7 d002 227c 9002 2005
0167560  1300 00f7 d022 627c 1500 00f7 d402 a27c 1700 00f7 d602 e28c 80a2 800b 0680 0004 0100 0000 7fff fcc9 0100 0000 1100 00f7
0167640  d002 22bc 1300 00f8 9212 6104 4000 ac48 0100 0000 1900 0122 d803 209c 8090 000c 0480 000a 0100 0000 1100 00f7 d002 22bc
0167720  1300 00f8 9212 6107 1500 0122 d402 a09c 4000 ac3b 0100 0000 1b00 0123 da03 6324 8090 000d 0480 000a 0100 0000 1100 00f7
0170000  d002 22bc 1300 00f8 9212 6125 1500 0123 d402 a324 4000 ac2e 0100 0000 1f00 0123 de03 e308 8090 000f 0480 000a 0100 0000
0170060  1100 00f7 d002 22bc 1300 00f8 9212 6141 1500 0123 d402 a308 4000 ac21 0100 0000 2100 0122 e004 209c 2300 0123 e204 6310
0170140  a204 4010 2500 0123 e224 a310 2700 0123 e604 e324 2900 0123 e805 230c a805 0013 2b00 0123 e825 630c 2d00 0123 ec05 a308
0170220  2f00 0123 ee05 e31c ae05 c016 3100 0123 ee26 231c 3300 0122 c026 609c 3500 0123 c026 a324 3700 0123 c026 e308 3900 0123
0170300  f807 2328 8090 001c 0480 001e 0100 0000 1100 00f7 d04a 225c 9210 0008 808a 607f 0280 000f 0100 0000 1500 00f7 d402 a2bc
0170360  8090 000a 0280 000a 0100 0000 1100 00f7 d002 22bc 1300 00f8 9212 6165 1500 0123 d402 a328 4000 abee 0100 0000 1700 0123
0170440  d602 e328 1900 0123 d803 2314 9803 000b 1b00 0123 d823 6314 1f00 0123 c023 e328 1080 0003 0100 0000 9010 2000 b010 0008
0170520  81c7 e008 81e8 0000 033f ffff 8200 6398 9de3 8001 7fff ff4d 0100 0000 9010 2050 7fff fecf 0100 0000 1100 00f8 9012 2193
0170600  4000 0b8a 0100 0000 7fff f890 0100 0000 1100 00f7 d002 224c 4000 16eb 0100 0000 7fff f4a6 0100 0000 1100 0123 d002 2318
0170660  8090 0008 0280 000b 0100 0000 1100 00f8 9012 2199 1300 00f8 9212 619d 4000 2c24 0100 0000 d027 bffc 1080 000b 0100 0000
0170740  1100 00f8 9012 21a0 4000 2198 0100 0000 1300 00f8 9212 61a4 4000 2c19 0100 0000 d027 bffc d207 bffc 8090 0009 0280 001e
0171020  0100 0000 1100 0123 d002 2318 8090 0008 0280 000c 0100 0000 1100 00f9 d002 21dc 1300 0123 d202 6318 9410 2002 d607 bffc
0171100  4000 1c8b 0100 0000 1080 000a 0100 0000 1100 00f9 d002 21dc 1300 00f8 9212 61a7 9410 2001 d607 bffc 4000 1c81 0100 0000
0171160  d007 bffc 4000 2e2e 0100 0000 1080 0008 0100 0000 1100 011e 9012 22c3 1300 00f8 9212 61ab 4000 ab8e 0100 0000 1100 00f7
0171240  d002 224c 4000 0e66 0100 0000 4000 0008 0100 0000 4000 ab6e 0100 0000 9010 2000 b010 0008 81c7 e008 81e8 0000 033f ffff
0171320  8200 6398 9de3 8001 c027 bffc 1100 0123 d002 2310 8090 0008 0480 0004 0100 0000 9210 2004 d227 bffc 1500 0123 d402 a30c
0171400  8090 000a 0480 0004 0100 0000 9610 2008 d627 bffc 1900 0123 d803 231c 8090 000c 0480 0004 0100 0000 9a10 200c da27 bffc
0171460  d007 bffc 9210 2002 4000 0337 0100 0000 d007 bffc 1080 0003 0100 0000 9010 2000 b010 0008 81c7 e008 81e8 0000 033f ffff
0171540  8200 63b8 9de3 8001 1100 00f7 d002 22c4 d027 bffc d207 bffc 8090 0009 0280 0010 0100 0000 d407 bffc d602 8000 8090 000b
0171620  0280 0006 0100 0000 d807 bffc c203 0000 9fc0 4000 0100 0000 da07 bffc de03 6004 de27 bffc 10bf fff0 0100 0000 9010 2000
0171700  b010 0008 81c7 e008 81e8 0000 033f ffff 8200 6398 9de3 8001 f027 a044 f227 a048 9010 2008 d207 a048 4000 54ca 0100 0000
0171760  d027 bffc d007 bffc d207 a044 d222 0000 d407 bffc 1700 00f7 d602 e2c4 d622 a004 d807 bffc 1b00 00f7 d823 62c4 9010 2000
0172040  b010 0008 81c7 e008 81e8 0000 033f ffff 8200 6388 9de3 8001 f027 a044 f227 a048 f427 a04c f627 a050 f827 a054 fa27 a058
0172120  1100 00f7 d002 2250 8090 0008 0280 0005 0100 0000 9010 200c 4000 abc1 0100 0000 9207 a044 d227 bffc d407 bffc 9402 a004
0172200  d427 bffc d602 bffc d627 bff8 d807 bffc 9803 2004 d827 bffc da03 3ffc da27 bff4 de07 bffc 9e03 e004 de27 bffc e003 fffc
0172260  e027 bff0 a210 2001 2500 00f7 e224 a250 7fff ffa7 0100 0000 1100 011e 9012 22b4 4000 ab3e 0100 0000 2700 00f7 e604 e2bc
0172340  8090 0013 0280 0056 0100 0000 d007 bff8 1207 bff4 d407 bff0 d607 bffc 7fff f908 0100 0000 7fff f7b1 0100 0000 7fff fe63
0172420  0100 0000 9010 2050 7fff fde5 0100 0000 7fff f7aa 0100 0000 1100 00f7 d002 224c 4000 1605 0100 0000 7fff f3c0 0100 0000
0172500  1100 0123 d002 2318 8090 0008 0280 000b 0100 0000 1100 00f8 9012 21e5 1300 00f8 9212 61e9 4000 2b3e 0100 0000 d027 bfec
0172560  1080 000b 0100 0000 1100 00f8 9012 21ec 4000 20b2 0100 0000 1300 00f8 9212 61f0 4000 2b33 0100 0000 d027 bfec d207 bfec
0172640  8090 0009 0280 001e 0100 0000 1100 0123 d002 2318 8090 0008 0280 000c 0100 0000 1100 00f9 d002 21dc 1300 0123 d202 6318
0172720  9410 2002 d607 bfec 4000 1ba5 0100 0000 1080 000a 0100 0000 1100 00f9 d002 21dc 1300 00f8 9212 61f3 9410 2001 d607 bfec
0173000  4000 1b9b 0100 0000 d007 bfec 4000 2d48 0100 0000 1080 0008 0100 0000 1100 011e 9012 22c8 1300 00f8 9212 61f7 4000 aaa8
0173060  0100 0000 1080 000a 0100 0000 d007 bff8 1207 bff4 d407 bff0 d607 bffc 7fff f97d 0100 0000 7fff fe11 0100 0000 1100 00f8
0173140  9012 2231 4000 0a51 0100 0000 1100 00f7 d002 224c 4000 0d72 0100 0000 7fff ff14 0100 0000 d027 bfe8 d007 bfe8 4000 aa78
0173220  0100 0000 9010 2000 b010 0008 81c7 e008 81e8 0000 033f ffff 8200 63a0 9de3 8001 f027 a044 f227 a048 f427 a04c f627 a050
0173300  f827 a054 1100 0048 9012 2268 1300 0106 d022 6340 d007 a04c d207 a050 4000 0aaa 0100 0000 1500 00f7 d022 a24c 8090 0008
0173360  1280 0008 0100 0000 9010 2000 9210 2053 1500 00f8 9412 a237 7fff ff49 0100 0000 9010 2000 1300 00f8 9212 6256 1500 00f7
0173440  9412 a25c 9610 2001 4000 0542 0100 0000 9010 2000 1300 00f8 9212 625b 1500 00f7 9412 a25c 9610 2001 4000 053a 0100 0000
0173520  9010 2000 1300 00f8 9212 625f 1500 00f7 9412 a25c 9610 2000 4000 0532 0100 0000 9010 2000 1300 00f8 9212 6262 1500 00f7
0173600  9412 a260 9610 2001 4000 052a 0100 0000 9010 2000 1300 00f8 9212 626b 1500 00f7 9412 a264 9610 2001 4000 0522 0100 0000
0173660  9010 2000 1300 00f8 9212 6270 1500 00f7 9412 a268 9610 2001 4000 051a 0100 0000 9010 2000 1300 00f8 9212 6276 1500 00f9
```

```
0173740  9412 a3c8 9610 2001 4000 0512 0100 0000 9010 2000 1300 00f8 9212 627c 1500 00f9 9412 a3c8 9610 2001 4000 050a 0100 0000
0174020  9010 2000 1300 00f8 9212 6287 1500 00f9 9412 a3c8 9610 2001 4000 0502 0100 0000 9010 2000 1300 00f8 9212 628a 1500 00f7
0174100  9412 a29c 9610 2001 4000 04fa 0100 0000 9010 2000 1300 00f8 9212 628c 1500 00f7 9412 a2a0 9610 2001 4000 04f2 0100 0000
0174160  9010 2000 1300 00f8 9212 6294 1500 00f7 9412 a25c 9610 2002 4000 04ea 0100 0000 9010 2001 1300 00f8 9212 629e 1500 00f7
0174240  9412 a2ac 9610 2000 4000 04e2 0100 0000 d007 a044 d207 a048 4000 05d6 0100 0000 1700 00f7 d64a e25c 9810 000b 80a3 2002
0174320  1280 0008 0100 0000 9010 2001 1300 00f7 d02a 62a4 9410 2001 1700 00f7 d42a e25c 1900 00f7 d84b 22a0 8090 000c 028c 0006
0174400  0100 0000 d007 a04c d207 a050 4000 0054 0100 0000 1b00 00f7 da03 62a8 8090 000d 0280 0006 0100 0000 0300 00f7 c200 62a8
0174460  9fc0 4000 0100 0000 4000 0225 0100 0000 4000 0872 0100 0000 1f00 00f9 de03 e1dc 8090 000f 1280 0008 0100 0000 9010 2000
0174540  9210 2053 1500 00f8 9412 a2a5 7fff feb0 0100 0000 2100 0123 e004 2318 8090 0010 0280 0018 0100 0000 9010 2000 9210 2000
0174620  d407 a054 1700 00f9 d602 e1dc 7fff f1e5 0100 0000 8090 0008 1280 000c 0100 0000 9010 2000 4000 4e33 0100 0000 9610 0008
0174700  9010 2000 9210 2053 1500 00f8 9412 a2bf 7fff fe97 0100 0000 1080 001b 0100 0000 1100 00f8 9012 22dc 4000 1f98 0100 0000
0174760  1300 00f8 9212 62e0 d407 a054 1700 00f9 d602 e1dc 7fff f1cb 0100 0000 8090 0008 1280 000d 0100 0000 1100 00f8 9012 22ff
0175040  4000 1f8a 0100 0000 9610 0008 9010 2000 9210 2053 1500 00f8 9412 a2e2 7fff fe7c 0100 0000 4000 0052 0100 0000 9010 2000
0175120  b010 0008 81c7 e008 81e8 0000 033f ffff 8200 6350 9de3 8001 f027 a044 f227 a048 d007 a048 d24a 0000 9410 0009 80a2 a02c
0175200  0280 0004 0100 0000 d607 a048 d94a c000 9a10 000c 8090 000d 0280 0007 0100 0000 de07 a048 9e03 e001 de27 a048 10bf fff1
0175260  0100 0000 e007 a048 e24c 0000 a410 0011 80a4 a02c 1280 000b 0100 0000 e607 a048 e84c e001 aa10 0014 80a5 6076 1280 0005
0175340  0100 0000 ec07 a048 ac05 a002 ec27 a048 9427 a028 9627 a050 1300 00f8 9212 6303 d007 a048 4000 a9b4 0100 0000 1100 00f8
0175420  9012 2308 4000 a992 0100 0000 1100 00f8 9012 231a 4000 a98e 0100 0000 1100 00f8 9012 234b 4000 a98a 0100 0000 9427 a028
0175500  9627 a04d 9827 a050 1100 00f8 9012 2361 d207 a044 4000 a982 0100 0000 2f00 00f9 ee05 e1dc 8090 0017 1280 0005 0100 0000
0175560  9010 2008 4000 a93e 0100 0000 9010 2000 b010 0008 81c7 e008 81e8 0000 033f ffff 8200 6398 9de3 8001 1100 0126 c022 2354
0175640  1300 0126 c022 6358 9410 2064 1700 0126 d422 e35c 1900 00f7 d803 22b0 8090 000c 1280 0006 0100 0000 1b00 00f8 9a13 6383
0175720  1f00 00f7 da23 e2b0 1100 00f7 d002 22b0 7fff e7e0 0100 0000 2100 00f7 e004 22ac 8090 0010 1280 000a 0100 0000 1100 00f7
0176000  d002 22b0 1300 00f7 d022 62ac 1500 00f8 9412 a384 1700 00f7 d422 e2b0 1100 00f7 d002 22ac 7fff e7cf 0100 0000 1900 00f7
0176060  d803 22ac d827 bffc da07 bffc de4b 4000 a010 000f 8090 0010 0280 006c 0100 0000 d007 bffc d24a 0000 9410 0009 80a2 a051
0176140  1280 000a 0100 0000 9010 2001 1300 0126 d022 6354 9410 2001 1700 0126 d422 e358 1080 0059 0100 0000 d807 bffc da4b 0000
0176220  9e10 000d 80a3 e050 1280 0007 0100 0000 9010 2001 1300 0126 d022 6354 1080 004e 0100 0000 d407 bffc d64a 8000 9810 000b
0176300  80a3 2046 1280 0007 0100 0000 9010 2001 1300 0126 d022 6358 1080 0043 0100 0000 d407 bffc d64a 8000 9810 000b 80a3 204e
0176360  1280 0007 0100 0000 9010 2064 1300 0126 d022 635c 1080 0038 0100 0000 d407 bffc d64a 8000 9810 000b 80a3 2041 1280 0006
0176440  0100 0000 1100 0126 c022 235c 1080 002e 0100 0000 d207 bffc d44a 4000 9610 000a 80a2 e057 1280 0007 0100 0000 9010 2004
0176520  1300 0126 d022 635c 1080 0023 0100 0000 d407 bffc d64a 8000 9810 000b 80a3 2045 1280 0007 0100 0000 9010 2008 1300 0126
0176600  d022 635c 1080 0018 0100 0000 d407 bffc d64a 8000 9810 000b 80a3 2044 1280 000c 0100 0000 1100 00f7 d002 22b0 9222 2001
0176660  d227 bffc 1500 00f8 9412 a385 1700 00f7 d422 e2b0 1080 0008 0100 0000 d007 bffc d24a 0000 1100 00f8 9012 2386 4000 a8e0
0176740  0100 0000 d207 bffc 9202 6001 d227 bffc 10bf ff92 0100 0000 1500 00f7 d44a a29c 8090 000a 1280 0005 0100 0000 9610 2064
0177020  1900 0126 d623 235c 1100 00f7 d002 22bc 4000 a418 0100 0000 1b00 0126 d023 6360 9010 2008 9210 2001 4000 0077 0100 0000
0177100  9010 2000 b010 0008 81c7 e008 81e8 0000 033f ffff 8200 6398 9de3 8001 1100 0126 d002 2354 8090 0008 1280 0005 0100 0000
0177160  9010 2001 1080 0065 0100 0000 1100 00f8 9012 23a3 1300 0126 d202 6360 4000 a8b4 0100 0000 1300 011e d202 62a0 9222 6001
0177240  1500 011e d222 a2a0 8090 0009 0680 000c 0100 0000 1700 011e d602 e2a4 9602 e001 1900 011e d623 22a4 9a22 e001 de0b 4000
0177320  a010 000f 1080 0007 0100 0000 1100 011e 9012 22a0 4000 a8ad 0100 0000 a010 0008 e027 bffc e207 bffc 80a4 6079 0280 000a
0177400  0100 0000 e407 bffc 80a4 a059 0280 0006 0100 0000 e607 bffc 80a4 e00a 1280 0020 0100 0000 d007 bffc 80a2 200a 0280 0019
0177460  0100 0000 1300 011e d202 62a0 9222 6001 1500 011e d222 a2a0 8090 0009 0680 000c 0100 0000 1700 011e d602 e2a4 9602 e001
0177540  1900 011e d623 22a4 9a22 e001 de0b 4000 a010 000f 1080 0007 0100 0000 1100 011e 9012 22a0 4000 a885 0100 0000 a010 0008
0177620  9010 2001 1080 001d 0100 0000 2300 011e e204 62a0 a224 6001 2500 011e e224 a2a0 8090 0011 0680 000c 0100 0000 2700 011e
0177700  e604 e2a4 a604 e001 2900 011e e625 22a4 aa24 e001 ec0d 4000 ae10 0016 1080 0007 0100 0000 1100 011e 9012 22a0 4000 a86b
0177760  0100 0000 ae10 0008 9010 2000 1080 0003 0100 0000 9010 2000 b010 0008 81c7 e008 81e8 0000 033f ffff 8200 6398 9de3 8001
0200040  f027 a044 f227 a048 d007 a044 1300 0126 d202 635c 80a2 0009 0680 000e 0100 0000 d407 a048 80a2 a001 0280 0007 0100 0000
0200120  7fff ff80 0100 0000 8090 0008 0280 0005 0100 0000 9610 2001 1080 0003 0100 0000 9610 2000 d627 bff8 1900 0126 d803 2358
0200200  8090 000c 1280 0011 0100 0000 da07 a048 80a3 6001 0280 000b 0100 0000 1f00 0126 de03 e354 8090 000f 0280 0006 0100 0000
0200260  e007 bff8 8090 0010 1280 0004 0100 0000 1080 0035 0100 0000 1100 00f8 9012 23bd 1300 00f8 9212 63ce 4000 a7f4 0100 0000
0200340  d027 bffc e207 bffc 8090 0011 1280 0004 0100 0000 1080 0028 0100 0000 e407 bff8 8090 0012 0280 0009 0100 0000 d007 bffc
0200420  1300 00f8 9212 63d0 1500 0126 d402 a360 4000 a7eb 0100 0000 d007 a048 80a2 2001 1280 0007 0100 0000 d007 bffc 1300 00f8
0200500  9212 63d9 4000 a7e2 0100 0000 d007 bffc 1300 00f9 9212 6000 4000 a7dd 0100 0000 d007 bffc 4000 a801 0100 0000 1300 0126
0200560  d202 6358 8090 0009 1280 0005 0100 0000 1100 00f9 9012 2015 4000 a816 0100 0000 9010 2000 b010 0008 81c7 e008 81e8 0000
0200640  033f ffff 8200 63c0 9de3 8001 f027 a044 d007 a044 1300 00f7 d022 62a8 9010 2000 b010 0008 81c7 e008 81e8 0000 033f ffff
0200720  8200 6398 9de3 8001 c027 bffc d007 bffc 932a 2002 1500 0122 9412 a0a0 d602 400a 8090 000b 0280 0019 0100 0000 d007 bffc
0201000  9202 2001 952a 6002 1700 0122 9612 e0a0 d402 800b d807 bffc 9b2b 2002 1f00 0122 9e13 e0a0 d203 400f 1100 00f9 9012 202d
```

| | | | | | | | | | | | | | | | | | | | | | | | | |
|---|---|---|---|---|---|---|---|---|---|---|---|---|---|---|---|---|---|---|---|---|---|---|---|---|
| 0201060 | 1700 | 00f9 | 9612 | e036 | 9810 | 2050 | 4000 | 0827 | 0100 | 0000 | e007 | bffc | a004 | 2002 | e027 | bffc | 10bf | ffe3 | 0100 | 0000 | 9010 | 2000 | b010 | 0008 |
| 0201140 | 81c7 | e008 | 81e8 | 0000 | 033f | ffff | 8200 | 63a0 | 9de3 | 8001 | 1100 | 0106 | d002 | 233c | 9210 | 23e8 | 4000 | a7db | 0100 | 0000 | ba10 | 0008 | 1100 | 0106 |
| 0201220 | d002 | 2338 | 9210 | 23e8 | 4000 | a7d5 | 0100 | 0000 | 9810 | 0008 | 9010 | 2000 | 9210 | 2053 | 1500 | 00f9 | 9412 | a037 | 9610 | 001d | 7fff | fc5d | 0100 | 0000 |
| 0201300 | 9010 | 2000 | b010 | 0008 | 81c7 | e008 | 81e8 | 0000 | 033f | ffff | 8200 | 63a0 | 9de3 | 8001 | f02f | a047 | f22f | a04b | f427 | a04c | 1100 | 0125 | d002 | 2114 |
| 0201360 | 8090 | 0008 | 0280 | 0013 | 0100 | 0000 | d24f | a047 | 9410 | 0009 | 80a2 | a001 | 0480 | 0006 | 0100 | 0000 | d64f | a04b | 8090 | 000b | 1280 | 000a | 0100 | 0000 |
| 0201440 | d007 | a04c | 1300 | 0125 | d202 | 6114 | 4000 | a77d | 0100 | 0000 | 8090 | 0008 | 0280 | 0008 | 0100 | 0000 | c02f | a04b | 1100 | 00f7 | c022 | 2288 | d207 | a04c |
| 0201520 | 1500 | 0125 | d222 | a114 | 9010 | 2000 | b010 | 0008 | 81c7 | e008 | 81e8 | 0000 | 033f | ffff | 8200 | 63a0 | 9de3 | 8001 | 1100 | 00f7 | d052 | 2258 | 9210 | 0008 |
| 0201600 | 80a2 | 6001 | 1280 | 0005 | 0100 | 0000 | 9010 | 2001 | 1080 | 003c | 0100 | 0000 | 1500 | 00f7 | d44a | a278 | 8090 | 000a | 0280 | 0015 | 0100 | 0000 | 1700 | 00f7 |
| 0201660 | d602 | e26c | 1900 | 00f7 | d803 | 2270 | 80a2 | c00c | 0480 | 000e | 0100 | 0000 | 1100 | 00f7 | d002 | 226c | 1300 | 00f7 | d202 | 6270 | 4000 | a788 | 0100 | 0000 |
| 0201740 | 80a2 | 2001 | 1280 | 0005 | 0100 | 0000 | 9010 | 2001 | 1080 | 0024 | 0100 | 0000 | 1b00 | 00f7 | da4b | 6274 | 8090 | 000d | 0280 | 001b | 0100 | 0000 | 1f00 | 00f7 |
| 0202020 | de53 | e258 | a010 | 000f | 8090 | 0010 | 0480 | 0015 | 0100 | 0000 | 2300 | 0123 | e254 | 6320 | 2500 | 00f7 | e454 | a258 | 80a4 | 4012 | 0680 | 000e | 0100 | 0000 |
| 0202100 | 1100 | 0123 | d052 | 2320 | 1300 | 00f7 | d252 | 6258 | 4000 | a76a | 0100 | 0000 | 80a2 | 2001 | 1280 | 0005 | 0100 | 0000 | 9010 | 2001 | 1080 | 0006 | 0100 | 0000 |
| 0202160 | 9010 | 2000 | 1080 | 0003 | 0100 | 0000 | 9010 | 2000 | b010 | 0008 | 81c7 | e008 | 81e8 | 0000 | 033f | ffff | 8200 | 6398 | 9de3 | 8001 | f027 | a044 | f227 | a048 |
| 0202240 | d007 | a048 | 4000 | a725 | 0100 | 0000 | 8090 | 0008 | 1680 | 0003 | 0100 | 0000 | 9002 | 2001 | 913a | 2001 | 1500 | 0124 | 9412 | a3be | 9622 | 8008 | 9822 | e001 |
| 0202320 | d827 | bff8 | 1b00 | 0124 | 9a13 | 6381 | da27 | bffc | de07 | bffc | e007 | bff8 | 80a3 | c010 | 1a80 | 000a | 0100 | 0000 | e207 | bffc | a410 | 2020 | e42c | 4000 |
| 0202400 | e607 | bffc | a604 | e001 | e627 | bffc | 10bf | fff5 | 0100 | 0000 | 1100 | 0124 | 9012 | 2381 | d207 | a044 | 7fff | efa9 | 0100 | 0000 | 9010 | 2000 | b010 | 0008 |
| 0202460 | 81c7 | e008 | 81e8 | 0000 | 033f | ffff | 8200 | 6398 | 9de3 | 8001 | 1100 | 00f7 | d002 | 2294 | 8090 | 0008 | 1280 | 0005 | 0100 | 0000 | 9010 | 2000 | 1080 | 0116 |
| 0202540 | 0100 | 0000 | 1300 | 00f7 | d202 | 62bc | 1500 | 011e | 9412 | a2b4 | 80a2 | 400a | 1280 | 0068 | 0100 | 0000 | c027 | bffc | 1100 | 00f7 | d002 | 2294 | 8090 | 0008 |
| 0202620 | 0480 | 0019 | 0100 | 0000 | d067 | bffc | 932a | 2002 | 1500 | 0125 | 9412 | a1a0 | d602 | 400a | 1300 | 00f9 | 9212 | 6072 | 1100 | 00f7 | d002 | 22bc | 1500 | 0123 |
| 0202700 | d402 | a32c | 4000 | a6c2 | 0100 | 0000 | 1700 | 00f7 | d602 | e294 | 9622 | e001 | 1900 | 00f7 | d623 | 2294 | da07 | bffc | 9a03 | 6001 | da27 | bffc | 10bf | ffe6 |
| 0202760 | 0100 | 0000 | 1f00 | 00f7 | de03 | e2bc | e003 | c000 | a024 | 2001 | e023 | c000 | 8090 | 0010 | 0680 | 000d | 0100 | 0000 | 2300 | 00f7 | e204 | 62bc | e404 | 6004 |
| 0203040 | a404 | a001 | e424 | 6004 | a624 | a001 | a310 | 200a | e82c | c000 | aa10 | 0014 | 1080 | 0035 | 0100 | 0000 | 2d00 | 00f7 | ec05 | a2bc | ee55 | a010 | b010 | 0017 |
| 0203120 | 808e | 2080 | 0280 | 0028 | 0100 | 0000 | 3300 | 00f7 | f206 | 62bc | f406 | 600c | 3700 | 00f7 | f606 | e2bc | f806 | c000 | ba20 | 001c | 80a7 | 401a | 1680 | 001e |
| 0203200 | 0100 | 0000 | 1100 | 00f7 | d002 | 22bc | d202 | 2004 | aa10 | 200a | ea2a | 4000 | 80a5 | 600a | 0280 | 000b | 0100 | 0000 | 1500 | 00f7 | d402 | a2bc | d602 | a004 |
| 0203260 | 9602 | e001 | d622 | a004 | 9822 | e001 | ea0b | 0000 | 1080 | 000b | 0100 | 0000 | 1b00 | 00f7 | da03 | 62bc | de03 | 6004 | d00b | c000 | 1300 | 00f7 | d202 | 62bc |
| 0203340 | 4000 | a6b1 | 0100 | 0000 | aa10 | 0008 | 1080 | 0008 | 0100 | 0000 | 9010 | 200a | 1300 | 00f7 | d202 | 62bc | 4000 | a6a9 | 0100 | 0000 | aa10 | 0008 | 9010 | 2000 |
| 0203420 | 1080 | 00a9 | 0100 | 0000 | 2100 | 00f7 | e04c | 225c | a210 | 0010 | 808c | 607f | 0280 | 0046 | 0100 | 0000 | 2500 | 00f7 | e404 | a294 | 8090 | 0012 | 0480 | 0041 |
| 0203500 | 0100 | 0000 | c027 | bffc | 1100 | 00f7 | d002 | 2294 | 8090 | 0008 | 0480 | 003b | 0100 | 0000 | 1100 | 00f7 | d002 | 22bc | 8090 | 0008 | 0280 | 001f | 0100 | 0000 |
| 0203560 | 1100 | 00f7 | d002 | 227c | 9002 | 2001 | 1300 | 00f7 | d022 | 627c | 1500 | 00f7 | d402 | a27c | 1700 | 00f7 | d602 | e28c | 80a2 | 800b | 0680 | 0004 | 0100 | 0000 |
| 0203640 | 7fff | f6c6 | 0100 | 0000 | d807 | bffc | 9b2b | 2002 | 1f00 | 0125 | 9e13 | e1a0 | d603 | 400f | 1300 | 00f9 | 9212 | 6077 | 1100 | 00f7 | d002 | 22bc | 1500 | 0123 |
| 0203720 | d402 | a32c | 4000 | a63e | 0100 | 0000 | 1080 | 000f | 0100 | 0000 | e007 | bffc | a32c | 2002 | 2500 | 0125 | a414 | a1a0 | d604 | 4012 | 1300 | 00f9 | 9212 | 607c |
| 0204000 | 1100 | 011e | 9012 | 22c8 | 1500 | 0123 | d402 | a32c | 4000 | a62f | 0100 | 0000 | 2700 | 00f7 | e604 | e294 | a624 | e001 | 2900 | 00f7 | e625 | 2294 | ea07 | bffc |
| 0204060 | aa05 | 6001 | ea27 | bffc | 10bf | ffc4 | 0100 | 0000 | 2d00 | 00f7 | ec4d | a25c | ae10 | 0016 | 808d | e07f | 0280 | 0055 | 0100 | 0000 | 3100 | 00f7 | f006 | 22bc |
| 0204140 | 8090 | 0018 | 0280 | 004a | 0100 | 0000 | 3300 | 00f7 | f206 | 62bc | f406 | 4000 | b426 | a001 | f426 | 4000 | 8090 | 001a | 0680 | 000d | 0100 | 0000 | 3700 | 00f7 |
| 0204220 | f606 | e2bc | f806 | e004 | b807 | 2001 | f826 | e004 | ba27 | 2001 | 9010 | 200a | d32f | 4000 | 9210 | 0008 | 1090 | 0035 | 0100 | 0000 | 1500 | 00f7 | d402 | a2bc |
| 0204300 | d652 | a010 | 9810 | 000b | 808b | 2080 | 0280 | 0028 | 0100 | 0000 | 1b00 | 00f7 | da03 | 62bc | de03 | 600c | 2100 | 00f7 | e004 | 22bc | e204 | 0000 | a420 | 0011 |
| 0204360 | 80a4 | 800f | 1680 | 001e | 0100 | 0000 | 2700 | 00f7 | e604 | e2bc | e804 | e004 | 9210 | 200a | d22d | 0000 | 80a2 | 600a | 0280 | 000b | 0100 | 0000 | 2b00 | 00f7 |
| 0204440 | ea05 | 62bc | ec05 | 6004 | ac05 | a001 | ec25 | 6004 | ae25 | a001 | d20d | c000 | 1080 | 000b | 0100 | 0000 | 3100 | 00f7 | f006 | 22bc | f206 | 2004 | d00e | 4000 |
| 0204520 | 1300 | 00f7 | d202 | 62bc | 4000 | a613 | 0100 | 0000 | 9210 | 0008 | 1080 | 0008 | 0100 | 0000 | 9010 | 200a | 1300 | 00f7 | d202 | 62bc | 4000 | a60b | 0100 | 0000 |
| 0204600 | 9210 | 0008 | 1080 | 0008 | 0100 | 0000 | 1100 | 011e | 9012 | 22c8 | 1300 | 00f9 | 9212 | 6081 | 4000 | a5cc | 0100 | 0000 | 9010 | 2000 | 1080 | 0003 | 0100 | 0000 |
| 0204660 | 9010 | 2000 | b010 | 0008 | 81c7 | e008 | 81e8 | 0000 | 033f | ffff | 8200 | 63a0 | 9de3 | 8001 | 1100 | 011e | 9012 | 22b4 | 4000 | a60c | 0100 | 0000 | 1100 | 011e |
| 0204740 | 9012 | 22c8 | 4000 | a608 | 0100 | 0000 | 9010 | 2000 | b010 | 0008 | 81c7 | e008 | 81e8 | 0000 | 033f | ffff | 8200 | 63c0 | 9de3 | 8001 | f027 | a044 | d007 | a044 |
| 0205020 | 124a | 0000 | 9410 | 0009 | 8090 | 000a | 0280 | 0014 | 0100 | 0000 | d607 | a044 | d84a | c000 | 9a10 | 000c | 1f00 | 011e | 9e13 | e199 | e04b | 400f | a210 | 0010 |
| 0205100 | 808c | 6004 | 1280 | 0005 | 0100 | 0000 | 901c | 2000 | 1080 | 000b | 0100 | 0000 | e407 | a044 | a404 | a001 | e427 | a044 | 10bf | ffea | 0100 | 0000 | 9010 | 2001 |
| 0205160 | 1080 | 0003 | 0100 | 0000 | 9010 | 2000 | b010 | 0008 | 81c7 | e008 | 81e8 | 0000 | 033f | ffff | 8200 | 63a0 | 9de3 | 8001 | f027 | a044 | 1100 | 00f9 | 9012 | 21e0 |
| 0205240 | d207 | a044 | 4000 | a5ae | 0100 | 0000 | 9010 | 2008 | 4000 | a56f | 0100 | 0000 | 9010 | 2000 | b010 | 0008 | 81c7 | e008 | 81e8 | 0000 | 033f | ffff | 8200 | 63a0 |
| 0205320 | 9de3 | 8001 | 1100 | 0126 | d002 | 23d4 | 8090 | 0008 | 0280 | 0004 | 0100 | 0000 | 1080 | 0008 | 0100 | 0000 | 9010 | 2400 | 4000 | 4eb3 | 0100 | 0000 | 1300 | 0126 |
| 0205400 | d022 | 63d4 | 9010 | 2000 | b010 | 0008 | 81c7 | e008 | 81e8 | 0000 | 033f | ffff | 8200 | 6398 | 9de3 | 8001 | f027 | a044 | 1100 | 0126 | d002 | 23cc | d027 | bffc |
| 0205460 | d207 | bffc | 8090 | 0009 | 0280 | 0011 | 0100 | 0000 | d407 | bffc | d202 | a008 | d007 | a044 | 4000 | a575 | 0100 | 0000 | 8090 | 0008 | 1280 | 0004 | 0100 | 0000 |
| 0205540 | 1080 | 0007 | 9100 | 0000 | d607 | bffc | d802 | c000 | d827 | bffc | 10bf | ffef | 0100 | 0000 | d007 | bffc | 1080 | 0003 | 0100 | 0000 | 9010 | 2000 | b010 | 0008 |
| 0205620 | 81c7 | e008 | 81e8 | 0000 | 033f | ffff | 8200 | 6398 | 9de3 | 8001 | f027 | a044 | f227 | a048 | f427 | a04c | f627 | a050 | 9010 | 2018 | 1300 | 0126 | d202 | 63d4 |
| 0205700 | 4000 | 4ed4 | 0100 | 0000 | d027 | bffc | d007 | bffc | 1300 | 0126 | d202 | 63cc | d222 | 0000 | d407 | bffc | 1700 | 0126 | d422 | e3cc | d807 | bffc | da07 | a044 |
| 0205760 | da23 | 2004 | de07 | bffc | e007 | a048 | e023 | e008 | e207 | bffc | e407 | a04c | e424 | 600c | e607 | bffc | e807 | a050 | e824 | e010 | ea07 | bffc | c025 | 6014 |
| 0206040 | 9010 | 2000 | b010 | 0008 | 81c7 | e008 | 81e8 | 0000 | 033f | ffff | 8200 | 6398 | 9de3 | 8001 | f027 | a044 | f227 | a048 | f427 | a04c | f627 | a050 | 7fff | ff9f |
| 0206120 | 0100 | 0000 | d007 | a048 | 7fff | e3c2 | 0100 | 0000 | d007 | a044 | d207 | a048 | d407 | a04c | d607 | a050 | 7fff | ffca | 0100 | 0000 | d007 | a044 | 8090 | 0008 |

```
0206200  1280 0033 0100 0000 d207 a048 d44a 4000 9610 000a 80a2 e02d 0280 0021 0100 0000 d807 a049 da4b 0000 9e10 000d 80a3 e04e
0206260  1280 0008 0100 0000 e007 a048 e24c 2001 a410 0011 80a4 a04f 0280 0021 0100 0000 d007 a048 4000 a519 0100 0000 0002 2003
0206340  1300 0126 d202 63d4 4000 4e8a 0100 0000 d027 bffc d007 bffc 1300 00f9 9212 61f3 4000 a4f6 0100 0000 d007 bffc d207 a048
0206420  4000 a510 0100 0000 d007 a050 8090 0008 1280 0005 0100 0003 9610 2001 1080 0003 0100 0000 9610 200c d207 bffc 9010 2000
0206500  d407 a04c 7fff ff95 0100 0000 9010 2000 b010 0008 81c7 e008 81e8 0000 033f ffff 8200 6398 9de3 8001 f027 a044 f227 a048
0206560  f427 a04c 7fff ff55 0100 0000 d007 a044 8090 0008 0280 0016 0100 0000 d007 a044 d202 0000 80a2 7fff 0280 0011 0100 0000
0206640  d007 a044 d402 2008 d207 a044 d202 6004 d607 a044 d64a e00c d807 a044 d003 0000 7fff ff9c 0100 0000 da07 a044 9a03 6010
0206720  da27 a044 10bf ffee 0100 0000 de07 a048 8090 000f 0280 0027 0100 0000 d007 a048 d202 0000 80a2 7fff 0280 0022 0100 0000
0207000  9010 2003 1300 0126 d202 63d4 4000 4e41 0100 0000 d027 bffc d007 bffc 9210 202d d22a 0000 d407 bffc d607 a048 d84a e004
0207060  d82a a001 da07 bffc c02b 6002 d007 bffc 7fff e348 0100 0000 de07 a048 d403 e008 e007 a048 d64c 200c e207 a048 d004 4000
0207140  d207 bffc 7fff ff4d 0100 0000 e407 a048 a404 a010 e427 a048 10bf ffdd 0100 0000 e607 a04c 8090 0013 0280 0042 0100 0000
0207220  d007 a04c d202 0000 8090 0009 0280 0034 0100 0000 1500 0126 d402 a3bc 80a2 a0c8 1680 002f 0100 0000 9010 2001 d027 bff8
0207300  d207 bff8 1500 0126 d402 a3bc 80a2 400a 1480 0011 0100 0000 d607 bff8 992a e002 1b00 0126 9a13 63d8 de03 000d e007 a04c
0207360  e204 0000 80a3 c011 0280 0007 0100 0000 e407 bff8 a404 a001 e427 bff8 10bf ffed 0100 0000 e607 bff8 2900 0126 e805 23bc
0207440  90a4 c014 0480 000d 0100 0000 2b00 0126 ea05 63bc aa05 6001 2d00 0126 ea25 a3bc af2d 6002 3100 0126 b016 23d8 f207 a04c
0207520  f406 4000 f425 c018 f607 a04c b606 e004 f627 a04c 10bf ffcb 0100 0000 3900 0126 f807 23bc 80a7 20c8 0680 0006 0100 0000
0207600  1100 00f9 9012 21f6 7fff fec0 0100 0000 9010 2000 b010 0008 81c7 e008 81e8 0000 033f ffff 8200 6398 9de3 8001 f027 a044
0207660  f227 a048 9010 2018 1300 0126 d202 63d4 4000 4dd4 0100 0000 d027 bffc d007 bffc 1300 0126 d202 63d0 d222 0000 d407 bffc
0207740  1700 0126 d422 e3d0 d807 bffc da07 a044 da23 2008 de07 bffc e007 a048 e023 e00c 9010 2000 b010 0008 81c7 e008 81e8 0000
0210020  033f ffff 8200 6370 9de3 8001 f027 a044 f227 a048 7fff fea7 0100 0000 9010 2001 d027 bfec 9210 2001 d227 bfe8 9410 2001
0210100  1700 0126 d422 e3b8 d807 a048 9a03 2004 da27 bfd8 de07 a044 9e23 e001 de27 a044 8090 000f 0480 0104 0100 0000 d007 bfd8
0210160  d202 0000 d227 bfe0 d407 bfd8 1700 00f9 9612 e21c d622 8000 d807 bfe0 da4b 0000 da2f bfe7 de4f bfe7 a010 000f 80a4 203a
0210240  0280 0007 0100 0000 e24f bfe7 a410 0011 80a4 a028 1280 0008 0100 0000 d007 bfe0 9002 2001 d027 bfe0 d24a 0000 d22f bfe7
0210320  c027 bfec d407 bfe0 d427 bfdc d607 bfdc 184a c000 9a10 000c 8090 000d 0280 000d 0100 0000 de07 bfdc e04b c000 a210 0010
0210400  80a4 603d 0280 0007 0100 0000 e407 bfdc a404 a001 e427 bfdc 10bf fff1 0100 0000 e607 bfdc e84c c000 aa10 0014 80a5 603d
0210460  1280 0028 0100 0000 d007 bfdc c02a 0000 d207 bfdc 9202 6001 d227 bfdc 1500 0126 d402 a3c0 972a a002 1900 0127 9813 230c
0210540  da07 bfe0 da22 c00c 1f00 0126 de03 e3c0 9e03 e001 2100 0126 de24 23c0 e207 bfe8 8090 0011 0280 0005 0100 0000 d007 bfdc
0210620  7fff e274 0100 0000 2500 0126 e404 a3c0 a72c a002 2900 0127 a815 230c ea07 bfdc ea24 c014 2d00 0126 ec05 a3c0 ac05 a001
0210700  2f00 0126 ec25 e3c0 1080 0094 0100 0000 f007 bfec 8090 0018 0280 004e 0100 0000 f24f bfe7 b410 0019 80a6 a02d 0280 0049
0210760  0100 0000 d007 bfe8 8090 0008 0280 0005 0100 0000 d007 bfe0 7fff e256 0100 0000 d207 bfd8 d407 bfe0 d422 4000 1700 0126
0211040  d602 e3b8 992a e002 1b00 0123 9a13 6330 de07 bfe0 de23 0004 2100 0126 e004 23b8 a32c 2002 e407 a048 e607 bfe0 e624 8011
0211120  2900 0126 e805 23b8 ab2d 2002 2300 0126 ac15 a3d8 ee05 4016 ee27 bfd4 3100 0126 f006 23b8 3300 0126 f206 63bc 80a6 0019
0211200  1480 0013 0100 0000 d007 bfd4 d207 bfe0 d222 0000 9027 a010 1300 00f9 9212 621d 1500 0126 d402 a3b8 4000 a383 0100 0000
0211260  c02f bff5 9027 a010 d207 bfe0 4000 01c9 0100 0000 1080 000c 0100 0000 1100 00f9 9012 2222 d207 bfe0 4000 a3a1 0100 0000
0211340  d007 bfe0 1300 00f9 9212 6237 4000 01bd 0100 0000 1100 0126 d002 23b8 9002 2001 1300 0126 d022 63b8 1080 0044 0100 0000
0211420  d007 bfe0 1300 00f9 9212 6241 4000 a381 0100 0000 8090 0008 1280 0005 0100 0000 c027 bfe8 1080 0039 0100 0000 d04f bfe7
0211500  9210 0008 8090 0009 0280 0034 0100 0000 1100 0126 d002 23c0 932a 2002 1500 0127 9412 a30c d607 bfe0 d622 400a 1900 0126
0211560  d803 23c0 9803 2001 1b00 0126 d823 63c0 d007 bfe0 7fff e1f7 0100 0000 d007 bfe0 7fff fde1 0100 0000 d027 bfd0 de07 bfd0
0211640  8090 000f 0280 001d 0100 0000 e007 bfd0 e204 2004 80a4 6001 1280 0018 0100 0000 e407 a044 80a4 a001 0480 0014 0100 0000
0211720  1100 0126 d002 23c0 932a 2002 1500 0127 9412 a30c d607 bfd8 9602 e004 d627 bfd8 d802 c000 d822 400a 1b00 0126 da03 63c0
0212000  9a03 6001 1f00 0126 da23 e3c0 e007 a044 a024 2001 e027 a044 2300 0126 e204 63c0 80a4 60c8 0480 0006 0100 0000 1100 00f9
0212060  9012 2244 7fff f195 0100 0000 2500 0126 e404 a3b8 80a4 a0c8 0480 0006 0100 0000 1100 00f9 9012 225f 7fff fd8c 0100 0000
0212140  e607 bfd8 a604 e004 e627 bfd8 10bf fefa 0100 0000 2900 0123 e805 2334 2b00 00f9 e825 61dc 2d00 0102 ec05 a1c0 8090 0016
0212220  1280 0006 0100 0000 2f00 00f9 ee05 e1dc 3100 0102 ee26 21c0 3300 0102 f206 61c4 8090 0019 1280 0006 0100 0000 3500 00f9
0212300  f406 a1dc 3700 0102 f426 e1c4 3900 0126 f807 23b8 bb2f 2002 d007 a048 c022 001d 4000 0052 0100 0000 4000 0009 0100 0000
0212360  9010 2000 1080 0003 0100 0000 9010 2000 b010 0008 81c7 e008 81e8 0000 033f ffff 8200 6398 9de3 8001 1100 0126 d002 23d0
0212440  d027 bff8 d207 bff8 8090 0009 0280 003b 0100 0000 1100 0126 d002 23cc d027 bffc d207 bffc 8090 0009 0280 0010 0100 0000
0212520  d407 bff8 d602 a00c d807 bffc da03 200c 80a3 400b 1280 0004 0100 0000 1080 0007 0100 0000 de07 bffc e003 c000 e027 bffc
0212600  10bf fff0 0100 0000 e207 bffc 8090 0011 0280 0007 0100 0000 e407 bffc e604 a014 8090 0013 0280 0004 0100 0000 1080 0016
0212660  0100 0000 e807 bffc ea05 2004 80a5 6001 1280 000b 0100 0000 ec07 bff8 d005 a008 ee07 bff8 f005 e00c d206 0000 4000 0101
0212740  0100 0000 1080 0008 0100 0000 f207 bff8 d006 6008 1300 00f9 9212 627d 4000 00f9 0100 0000 f407 bff8 f606 8000 f627 bff8
0213020  10bf ffc5 0100 0000 9010 2000 b010 0008 81c7 e008 81e8 0000 033f ffff 8200 6398 9de3 8001 1100 0126 d002 23c4 1300 0126
0213100  d202 63c0 80a2 0009 1680 0014 0100 0000 1100 0126 d002 23c4 932a 2002 1500 0127 9412 a30c d602 400a d627 bffc 1900 0126
0213160  d803 23c4 9803 2001 1b00 0126 d823 63c4 d007 bffc 9210 2001 4000 0008 0100 0000 10bf ffe9 0100 0000 9010 2000 b010 0008
0213240  81c7 e008 81e8 0000 033f ffff 8200 6390 9de3 8001 f027 a044 f227 a048 d007 a044 7fff e128 0100 0000 d007 a044 7fff fd12
```

| | | | | | | | | | | | | | | | | | | | | | | | | |
|---|---|---|---|---|---|---|---|---|---|---|---|---|---|---|---|---|---|---|---|---|---|---|---|---|
| 0213320 | 0100 | 0000 | d027 | bffc | d007 | bffc | 8090 | 0008 | 1280 | 003b | 0100 | 0000 | d007 | a044 | d24a | 0000 | 9410 | 0009 | 80a2 | a02d | 1280 | 0028 | 0100 | 0000 |
| 0213400 | d007 | a044 | 4000 | a28d | 0100 | 0000 | 80a2 | 2002 | 0480 | 0022 | 0100 | 0000 | 9010 | 202d | d02f | bff9 | c02f | bffb | d207 | a044 | 9202 | 6001 | d227 | a044 |
| 0213460 | d407 | a044 | d64a | 8000 | 9010 | 000b | 8090 | 000c | 0280 | 0014 | 0100 | 0000 | d007 | a044 | d24a | 0000 | d22f | bffa | 9027 | a007 | d207 | a048 | 7fff | ffd3 |
| 0213540 | 0100 | 0000 | 8090 | 0008 | 0280 | 0005 | 0100 | 0000 | 9010 | 2001 | 1080 | 007b | 0100 | 0000 | d407 | a044 | 9402 | a001 | d427 | a044 | 10bf | ffea | 0100 | 0000 |
| 0213620 | 1080 | 000c | 0100 | 000c | 1100 | 00f9 | 9012 | 2287 | d207 | a044 | 4000 | a26e | 0100 | 0000 | d007 | a044 | 1300 | 00f9 | 9212 | 629b | 4000 | 008a | 0100 | 0000 |
| 0213700 | 9010 | 2000 | 1080 | 0067 | 0100 | 0000 | d007 | bffc | d202 | 2704 | 80a2 | 6001 | 1280 | 0009 | 0100 | 0000 | d407 | a048 | 8090 | 000a | 1280 | 0005 | 0100 | 0000 |
| 0213760 | 9010 | 2001 | 1080 | 005b | 0100 | 0000 | d607 | bffc | d802 | e014 | 8090 | 000c | 0280 | 0009 | 0100 | 0000 | da07 | a048 | 8090 | 000d | 1280 | 0005 | 0100 | 0000 |
| 0214040 | 9010 | 2000 | 1080 | 004f | 0100 | 0000 | 1080 | 003c | 0100 | 0000 | d007 | bffc | d202 | 200c | d407 | bffc | d602 | a010 | d62a | 4000 | d807 | bffc | d003 | 2008 |
| 0214120 | 1300 | 00f9 | 9212 | 62a5 | 4000 | 0062 | 0100 | 0000 | 1080 | 0038 | 0100 | 0000 | 1b00 | 0126 | da03 | 63c4 | 1f00 | 0126 | de03 | e3c0 | 80a3 | 400f | 1680 | 0010 |
| 0214200 | 0100 | 0000 | 1100 | 0126 | d002 | 23c4 | 932a | 2002 | 1500 | 0127 | 9412 | a30c | d602 | 400a | d627 | bff4 | 1900 | 0126 | d803 | 23c4 | 9803 | 2001 | 1b00 | 0126 |
| 0214260 | d823 | 63c4 | 1080 | 0003 | 0100 | 0000 | c027 | bff4 | d007 | bffc | d202 | 200c | d407 | bff4 | d422 | 4000 | d607 | bffc | d002 | e008 | d207 | bff4 | 4000 | 0041 |
| 0214340 | 0100 | 0000 | 1080 | 0017 | 0100 | 0000 | d807 | bffc | da03 | 200c | de07 | a044 | de23 | 4000 | e007 | bffc | d004 | 2008 | 1300 | 00f9 | 9212 | 62b1 | 4000 | 0035 |
| 0214420 | 0100 | 0000 | 1080 | 000b | 0100 | 0000 | e207 | bffc | d004 | 6004 | 80a2 | 2000 | 02bf | ffc3 | 80a2 | 2001 | 02bf | ffce | 80a2 | 2002 | 02bf | ffed | 0100 | 0000 |
| 0214500 | e407 | bffc | d004 | a00c | 4000 | 0009 | 0100 | 0000 | 9010 | 2000 | 1080 | 0003 | 0100 | 0000 | 9010 | 2000 | b010 | 0008 | 81c7 | e008 | 81e8 | 0000 | 033f | ffff |
| 0214560 | 8200 | 63b8 | 9de3 | 8001 | f027 | a044 | 1100 | 0126 | d002 | 23cc | d027 | bffc | d207 | bffc | 8090 | 0009 | 0280 | 0010 | 0100 | 0000 | d407 | bffc | d602 | a00c |
| 0214640 | d807 | a044 | 80a2 | c00c | 1280 | 0005 | 0100 | 0000 | da07 | bffc | 9e10 | 2001 | de23 | 6014 | e007 | bffc | e204 | 0000 | e227 | bffc | 10bf | fff0 | 0100 | 0000 |
| 0214720 | 9010 | 2000 | b010 | 0008 | 81c7 | e008 | 81e8 | 0000 | 033f | ffff | 8200 | 6398 | 9de3 | 8001 | f027 | a044 | f227 | a048 | 1100 | 0126 | d002 | 23c8 | 80a2 | 2190 |
| 0215000 | 0480 | 0004 | 0100 | 0000 | 1080 | 002f | 0100 | 0000 | d007 | a044 | 4000 | a1c9 | 0100 | 0000 | 9002 | 2001 | 1300 | 0126 | d202 | 63d4 | 4000 | 4b3a | 0100 | 0000 |
| 0215060 | d027 | bffc | d007 | bffc | d207 | a044 | 4000 | a1a7 | 0100 | 0000 | 1300 | 0126 | d202 | 63c8 | 952a | 6002 | 1700 | 0122 | 9612 | e0a0 | d807 | bffc | d822 | 800b |
| 0215140 | 1b00 | 0126 | da03 | 63c8 | 9a03 | 6001 | 1f00 | 0126 | da23 | e3c8 | e007 | a048 | 8090 | 0010 | 1280 | 0005 | 0100 | 0000 | 2300 | 00f9 | a214 | 62bd | e227 | a048 |
| 0215220 | 2500 | 0126 | e404 | a3c8 | a72c | a002 | 2900 | 0122 | a815 | 20a0 | ea07 | a048 | ea24 | c014 | 2d00 | 0126 | ec05 | a3c8 | ac05 | a001 | 2f00 | 0126 | ec25 | e3c8 |
| 0215300 | 9010 | 2000 | b010 | 0008 | 81c7 | e008 | 81e8 | 0000 | 033f | ffff | 8200 | 63a0 | 9de3 | 8001 | f027 | a044 | d007 | a044 | 9210 | 2000 | 7fff | fef0 | 0100 | 0000 |
| 0215360 | 1080 | 0003 | 0100 | 0000 | 9010 | 2000 | b010 | 0008 | 81c7 | e008 | 81e8 | 0000 | 033f | ffff | 8200 | 63a0 | 9de3 | 8001 | 4000 | 162b | 0100 | 0000 | 1300 | 0128 |
| 0215440 | d022 | 6248 | 1500 | 0128 | d022 | a240 | 4000 | 1645 | 0100 | 0000 | 1700 | 0128 | d022 | e24c | 1900 | 0128 | d023 | 2244 | 1b00 | 00f9 | da4b | 63c8 | 8090 | 000d |
| 0215520 | 0280 | 0012 | 0100 | 0000 | 1100 | 00fa | 9012 | 2016 | 1300 | 00fa | 9212 | 604b | 4000 | a17d | 0100 | 0000 | 1100 | 00fa | 9012 | 204d | 1300 | 00fa | 9212 | 6081 |
| 0215600 | 4000 | a177 | 0100 | 0000 | 1100 | 011e | 9012 | 22b4 | 4000 | a18e | 0100 | 0000 | 1080 | 0003 | 0100 | 0000 | 9010 | 2000 | b010 | 0008 | 81c7 | e008 | 81e8 | 0000 |
| 0215660 | 033f | ffff | 8200 | 6350 | 9de3 | 8001 | f027 | a044 | 4000 | 1600 | 0100 | 0000 | d027 | bffc | 4000 | 161d | 0100 | 0000 | d027 | bff8 | d007 | bffc | 1300 | 0128 |
| 0215740 | d202 | 6248 | 9422 | 0009 | d427 | bff4 | d607 | bffc | 1900 | 0128 | d803 | 2248 | 9a22 | c00c | da23 | a070 | c103 | a070 | 85a0 | 1900 | 1f00 | 00f9 | c91b | e3d0 |
| 0216020 | 8da0 | 89c4 | cd3f | bfe8 | e007 | bff8 | 2300 | 0128 | e204 | 624c | a424 | 0011 | e423 | a070 | cf03 | a070 | 91a0 | 1907 | 2700 | 00f9 | d51c | e3d0 | 99a2 | 09ca |
| 0216100 | d93f | bfe0 | 2900 | 00f9 | dd1d | 23d8 | e11f | bfe0 | 81ac | 0ace | 0100 | 0000 | 0100 | 0000 | 1d80 | 000b | 0100 | 0000 | 2b00 | 00f9 | e51d | 63e0 | e91f | bfe8 |
| 0216160 | ada5 | 0952 | f11f | bfe0 | b5a5 | 39d8 | f53f | bfd8 | 1080 | 0005 | 0100 | 0000 | 2d00 | 00f9 | f91d | a3d8 | f93f | bfd8 | ee07 | bffc | 3100 | 0128 | ee26 | 2248 |
| 0216240 | f207 | bff8 | 3500 | 0128 | f226 | a24c | 3700 | 00f9 | f64e | e3c8 | 8090 | 001b | 0280 | 0025 | 0100 | 0000 | 1100 | 0106 | d002 | 2338 | 9202 | 23ff | 8090 | 0009 |
| 0216320 | 1680 | 0003 | 0100 | 0000 | 9202 | 63ff | 933a | 600a | d223 | a064 | 1700 | 0106 | d602 | e33c | 9802 | e3ff | 8090 | 000c | 1680 | 0003 | 0100 | 0000 | 9803 | 23ff |
| 0216400 | 993b | 200a | d823 | a068 | de07 | bfd8 | e007 | bfdc | de23 | a05c | e023 | a060 | 1100 | 00fa | 9012 | 2083 | d207 | a044 | d407 | bfe8 | d607 | bfec | d807 | bfe0 |
| 0216460 | da07 | bfe4 | 4000 | a19a | 0100 | 0000 | 1100 | 011e | 9012 | 22b4 | 4000 | a121 | 0100 | 0000 | 9027 | a034 | 1300 | 00fa | 9212 | 60b3 | d407 | bfe8 | d607 | bfec |
| 0216540 | 4000 | a0d5 | 0100 | 0000 | c02f | bfd7 | d007 | bff4 | 1080 | 0003 | 0100 | 0000 | 9010 | 2000 | b010 | 0008 | 81c7 | e008 | 81e8 | 0000 | 033f | ffff | 8200 | 6360 |
| 0216620 | 9de3 | 8001 | f027 | a044 | 4000 | 158a | 0100 | 0000 | d027 | bffc | 4000 | 15a7 | 0100 | 0000 | d027 | bff8 | d007 | bffc | 1300 | 0128 | d202 | 6248 | 9422 | 0009 |
| 0216700 | d427 | bff4 | d607 | bffc | 1900 | 0128 | d803 | 2248 | 9a22 | c00c | da23 | a070 | c103 | a070 | 85a0 | 1900 | 1f00 | 00f9 | c91b | e3e8 | 8da0 | 89c4 | 8fa0 | 18c6 |
| 0216760 | cf27 | bff0 | e007 | bff8 | 2300 | 0128 | e204 | 624c | a424 | 0011 | e423 | a070 | d103 | a070 | 95a0 | 1908 | 2700 | 00f9 | d91c | e3e8 | 9da2 | 89cc | 9fa0 | 18ce |
| 0217040 | df27 | bfec | 2900 | 00f9 | e11d | 23f0 | e507 | bfec | a9a0 | 1932 | 81ad | 0ad0 | 0100 | 0000 | 0100 | 0000 | 1d80 | 000e | 0100 | 0000 | 2b00 | 00f9 | ed1d | 63f8 |
| 0217120 | f107 | bff0 | b5a0 | 1938 | b9a6 | 8956 | f407 | bfec | 81a0 | 193e | 85a7 | 09c0 | 87a0 | 18c2 | c727 | bfe8 | 1080 | 0005 | 0100 | 0000 | 2d00 | 00fa | c905 | a000 |
| 0217200 | c927 | bfe8 | ee07 | bffc | 3100 | 0128 | ee26 | 2248 | f207 | bff8 | 3500 | 0128 | f226 | a24c | 3700 | 00f9 | f64e | e3c8 | 8090 | 001b | 0280 | 002d | 0100 | 0000 |
| 0217260 | 1100 | 0106 | d002 | 2338 | 9202 | 23ff | 8090 | 0009 | 1680 | 0003 | 0100 | 0000 | 9202 | 63ff | 933a | 600a | d223 | a064 | 1700 | 0106 | d602 | e33c | 9802 | e3ff |
| 0217340 | 8090 | 000c | 1680 | 0003 | 0100 | 0000 | 9803 | 23ff | 993b | 200a | d823 | a068 | c107 | bfe8 | 85a0 | 1920 | c523 | a05c | c723 | a060 | 1100 | 00fa | 9012 | 20b9 |
| 0217420 | d207 | a044 | c707 | bff0 | 89a0 | 1923 | c923 | a070 | d403 | a070 | cb23 | a070 | d603 | a070 | cb07 | bfec | 8da0 | 1925 | cd23 | a074 | d803 | a074 | cf23 | a074 |
| 0217500 | da03 | a074 | 4000 | a086 | 0100 | 0000 | 1100 | 011e | 9012 | 22b4 | 4000 | a09d | 0100 | 0000 | 9027 | a024 | 1300 | 00fa | 9212 | 60e9 | cf07 | bff0 | 91a0 | 1927 |
| 0217560 | d123 | a070 | d403 | a070 | d323 | a070 | d603 | a070 | 4000 | a04d | 0100 | 0000 | c02f | bfe7 | d007 | bff4 | 1080 | 0003 | 0100 | 0000 | 9010 | 2000 | b010 | 0008 |
| 0217640 | 81c7 | e008 | 81e8 | 0000 | 033f | ffff | 8200 | 6370 | 9de3 | 8001 | f027 | a044 | 4000 | 1502 | 0100 | 0000 | d027 | bffc | 4000 | 151f | 0100 | 0000 | d027 | bff8 |
| 0217720 | d007 | bffc | 1300 | 0128 | d202 | 6240 | 9422 | 0009 | d423 | a070 | c103 | a070 | 85a0 | 1900 | 1700 | 00fa | c91a | e008 | 8da0 | 89c4 | 8fa0 | 18c6 | cf27 | bff4 |
| 0220000 | d907 | bff8 | 1b00 | 0128 | da03 | 6244 | 9e23 | 000d | de23 | a070 | d103 | a070 | 95a0 | 1908 | 2100 | 00fa | d91c | 2008 | 9da2 | 89cc | 9fa0 | 18ce | df27 | bff0 |
| 0220060 | 2300 | 00fa | e11c | 6010 | e507 | bff4 | a9a0 | 1932 | ada5 | 0950 | f107 | bff0 | b5a0 | 1938 | b9a5 | 89da | bba0 | 18dc | fb27 | bfec | 2500 | 00f9 | e44c | a3c8 |
| 0220140 | 8090 | 0012 | 0280 | 002d | 0100 | 0000 | 1100 | 0106 | d002 | 2338 | 9202 | 23ff | 8090 | 0009 | 1680 | 0003 | 0100 | 0000 | 9202 | 63ff | 933a | 600a | d223 | a064 |
| 0220220 | 1700 | 0106 | d602 | e33c | 9802 | e3ff | 8090 | 000c | 1680 | 0003 | 0100 | 0000 | 9803 | 23ff | 993b | 200a | d823 | a068 | c107 | bfec | 85a0 | 1920 | c523 | a05c |
| 0220300 | c723 | a060 | 1100 | 00fa | 9012 | 20ef | d207 | a044 | c707 | bff4 | 89a0 | 1923 | c923 | a070 | d403 | a070 | cb23 | a070 | d603 | a070 | cb07 | bff0 | 8da0 | 1925 |
| 0220360 | cd23 | a074 | d803 | a074 | cf23 | a074 | da03 | a074 | 4000 | a017 | 0100 | 0000 | 1100 | 011e | 9012 | 22b4 | 4000 | a02e | 0100 | 0000 | 1080 | 0003 | 0100 | 0000 |

```
0220440 9010 2000 b010 0008 81c7 e008 81e8 0000 033f ffff 8200 6398 9de3 8001 f027 a044 d007 a044 4000 a033 0100 0000 d027 bffc
0220520 d007 bffc 9090 0008 1280 0004 0100 000c 7fff f842 0100 0000 d007 bffc 1080 0003 0100 0000 9010 2000 b010 0008 81c7 e008
0220600 81e8 0000 033f ffff 8200 6390 9de3 8001 f027 a044 f227 a048 9010 2400 4000 4909 0100 0000 d027 bff4 9010 2010 d207 bff4
0220660 4000 4958 0100 0000 d027 bffc d007 bffc d207 bff4 d222 2004 d407 bffc d202 a004 9010 2018 4000 494f 0100 0000 d607 bffc
0220740 d022 c000 d807 bffc da03 0000 da27 bff8 d007 a044 4000 9fd1 0100 0000 9002 2001 de07 bffc d203 e004 4000 4942 0100 0000
0221020 e007 bff8 d024 0000 e207 bff8 d004 4000 d207 a044 4000 9fad 0100 0000 d007 a048 4000 9fc2 0100 0000 9002 2001 e407 bffc
0221100 d204 a004 4000 4933 0100 0000 e607 bff8 d024 e004 e807 bff8 d005 2004 d207 a048 4000 9f9e 0100 0000 ea07 bffc d205 6004
0221160 9010 2001 4000 4927 0100 0000 ec07 bff8 d025 a008 ee07 bff8 d005 e008 4000 1499 0100 0000 f007 bff8 c026 200c f207 bff8
0221240 c026 6010 f407 bff8 c026 a014 f607 bffc c026 e00c f807 bffc c027 2009 d007 bffc 1080 0003 0100 0000 9010 2000 b010 0008
0221320 81c7 e008 81ed 0000 033f ffff 8200 6398 9de3 8001 f027 a044 f227 a048 f427 a04c f627 a050 f82f a057 1100 00f7 d002 224c
0221400 8090 0008 1280 0004 0100 0000 1080 0077 0100 0000 1300 00f7 d202 624c d402 4000 d427 bffc d607 bffc d802 e00c 8090 000c
0221460 1280 0012 0100 0000 1100 00f7 d002 224c d202 2004 9010 2018 4000 48f2 0100 0000 d207 bffc d022 600c d407 bffc d602 a00c
0221540 d627 bff8 d807 bffc da03 200c c023 6014 1080 0011 0100 0000 d007 bffc d202 200c d227 bff8 1500 00f7 d402 a24c d202 a004
0221620 9010 2018 4000 48df 0100 0000 d607 bffc d022 e00c d807 bffc da03 200c de07 bff8 de23 6014 d007 a044 4000 9f60 0100 0000
0221700 9002 2001 2100 00f7 e004 224c d204 2004 4000 48d0 0100 0000 e207 bffc e404 600c d024 8000 e607 bffc e804 e00c d005 0000
0221760 d207 a044 4000 9f39 0100 0000 d007 a048 4000 9f4e 0100 0000 9002 2001 2b00 00f7 ea05 624c d205 6004 4000 48be 0100 0000
0222040 ec07 bffc ee05 a00c d025 e004 f007 bffc f206 200c d006 6004 d207 a048 4000 9f27 0100 0000 d007 a04c 4000 9f3c 0100 0000
0222120 9002 2001 3500 00f7 f406 a24c d206 a004 4000 48ac 0100 0000 f607 bffc f806 e00c d027 2008 fa07 bffc d007 600c d002 2008
0222200 d207 a04c 4000 9f15 0100 0000 d007 a050 4000 9f2a 0100 0000 9002 2001 1300 00f7 d202 624c d202 6004 4000 489a 0100 0000
0222260 d407 bffc d602 a00c d022 e00c d807 bffc da03 200c d003 600c d207 a050 4000 9f03 0100 0000 de07 bffc e003 e00c e24f a057
0222340 e22c 2010 9010 2000 b010 0008 81c7 e008 81e8 0000 033f ffff 8200 6398 9de3 8001 f027 a044 f227 a048 d007 a044 d207 a048
0222420 9410 2001 4000 0020 0100 0000 d027 bffc d007 bffc 1080 0003 0100 0000 9010 2000 b010 0008 81c7 e008 81e8 0000 033f ffff
0222500 8200 6398 9de3 8001 f027 a044 f227 a048 d007 a044 d207 a048 9410 2000 4000 000e 0100 0000 d027 bffc 1100 00fa 9012 22a8
0222560 4000 9efb 0100 0000 d007 bffc 1080 0003 0100 0000 9010 2000 b010 0008 81c7 e008 81e8 0000 033f ffff 8200 6388 9de3 8001
0222640 f027 a044 f227 a048 f427 a04c 1100 00f7 d002 224c 8090 0008 1280 0017 0100 0000 d007 a048 d24a 2001 9410 0009 80a2 a066
0222720 1280 0009 0100 0000 901c 2000 d207 a044 4000 42d8 0100 0000 d027 bff0 1080 0007 0100 0000 d007 a044 d207 a048 4000 9eab
0223000 0100 0000 d027 bff0 d007 bff0 1080 0121 0100 0000 1700 00f7 d602 e24c d202 e004 9010 2009 4000 483b 0100 0000 d027 bfe8
0223060 d007 bfe8 1300 00fa 9212 62cd 4000 9ea7 0100 0000 d807 a048 da4b 0000 9e10 000d 80a3 e072 1280 002f 0100 0000 d007 a048
0223140 d24a 2001 9410 0009 80a2 a066 1280 0009 0100 0000 9010 2000 d207 a044 4000 42b1 0100 0000 d027 bff0 1080 0014 0100 0000
0223220 d607 a04c 9090 000b 0280 000a 0100 0000 1007 a044 1300 00fa 9212 62cf 4000 9e7f 0100 0000 d027 bff0 1080 0008 0100 0000
0223300 d007 a044 1300 00fa 9212 62d2 4000 9e77 0100 0000 d027 bff0 d807 bff0 8090 000c 0280 000c 0100 0000 d007 bff0 4000 0d45
0223360 0100 0000 9210 0008 d007 bfe8 4000 9e77 0100 0000 d007 bff0 4000 9e98 0100 0000 d007 a048 d24a 2001 9410 0009 80a2 a066
0223440 1280 0019 0100 0000 d007 a048 d24a 0000 9410 0009 80a2 a072 1280 0008 0100 0000 9010 2000 d207 a044 4000 427e 0100 0000
0223520 1080 0006 0100 0000 9010 2000 d207 a044 4000 4255 0100 0000 d027 bff0 d007 bff0 4000 42c4 0100 0000 d027 a044 1080 0007
0223600 0100 0000 d007 a044 d207 a048 4000 9e47 0100 0000 d027 bff0 d007 bff0 8090 0008 1280 0005 0100 0000 9010 2000 1080 00b9
0223660 0100 0000 1300 00f7 d202 624c d402 4000 d427 bffc d607 bffc d802 e010 8090 000c 1280 000f 0100 0000 1100 00f7 d002 224c
0223740 d202 2004 9010 2020 4000 47ca 0100 0000 d207 bffc d022 6010 d407 bffc d602 a010 c022 e01c 1080 0011 0100 0000 d007 bffc
0224020 d202 2010 d227 bff8 1500 00f7 d402 a24c d202 a004 9010 2020 4000 47ba 0100 0000 d607 bffc d022 e010 d807 bffc da03 2010
0224100 de07 bff8 de23 601c e007 bffc e204 2010 e407 bfe8 e424 6009 e607 bffc e804 e010 c025 2014 ea07 bffc ec05 6010 c025 a018
0224160 ee07 bffc f005 e010 f207 a048 f44e 4000 f42e 2010 d007 a044 4000 9e2c 0100 0000 9002 2001 3700 00f7 f606 e24c d206 e004
0224240 4000 479c 0100 0000 f807 bffc fa07 2010 d027 4000 d007 bffc d202 2010 d002 4000 d207 a044 4000 9e05 0100 0000 1500 00f7
0224320 d402 a24c d602 a004 d207 a048 d007 a044 d407 bff0 4000 132c 0100 0000 d027 bff4 d607 bffc d802 e010 da07 bfe8 da23 2008
0224400 de07 bff4 e003 e004 8090 0010 1280 0016 0100 0000 d007 a044 4000 9e08 0100 0000 9002 2001 1300 00f7 d202 624c d202 6004
0224460 4000 4778 0100 0000 d407 bffc d602 a010 d022 e004 d807 bffc da03 2010 d003 6004 d207 a044 4000 9de1 0100 0000 1080 0007
0224540 0100 0000 de07 bffc e003 e010 e207 bff4 e404 6004 e424 2004 e607 a048 e84c c000 aa10 0014 80a5 6072 1280 0009 0100 0000
0224620 ec07 bffc ee05 a010 f007 bff4 f206 2008 f225 e00c 1080 0014 0100 0000 1100 00f7 d002 224c d202 2004 9010 200d 4000 4755
0224700 0100 0000 d207 bffc d402 6010 d022 a00c d607 bffc d802 e010 d003 200c 1b00 00f7 da03 624c de03 4000 d203 e008 4000 9dbb
0224760 0100 0000 2100 00f7 e004 224c d204 2004 9010 200c 4000 4743 0100 0000 d027 bfec d007 a044 4000 9dc9 0100 0000 9002 2001
0225040 2300 00f7 e204 624c d204 6004 4000 4739 0100 0000 e407 bfec d024 a004 e607 bfec d004 e004 d207 a044 4000 9da4 0100 0000
0225120 e807 bfec ea07 bff0 ea25 0000 ec07 bfec 2c00 00f7 ee05 e24c f005 e008 f025 a008 3300 00f7 f206 624c f407 bfec f426 6008
0225200 d007 bff0 1080 0003 0100 0000 9010 2000 b010 0008 81c7 e008 81e8 0000 033f ffff 8200 6398 9de3 8001 f027 a044 1100 00f7
0225260 d002 224c 8090 0008 0280 0006 0100 0000 d207 a044 8090 0009 1280 0005 0100 0000 9010 3ffe 1080 0057 0100 0000 d407 a044
0225340 1700 00f7 d602 e24c 80a2 800b 1280 0008 0100 0000 9010 2000 9210 2046 1500 00fa 9412 a2d5 7fff f24a 0100 0000 1900 00f7
0225420 d803 224c da03 2008 da27 bff8 de07 bff8 9090 000f 0280 0010 0100 0000 d007 a044 d202 200c d407 bff8 d602 8000 80a2 c009
0225500 1280 0004 0100 0000 1080 0007 0100 0000 1807 bff8 da03 2008 da27 bff8 10bf fff0 0100 0000 de07 bff8 8090 000f 1280 0005
```

| | | | | | | | | | | | | | | | | | | | | | | | | |
|---|---|---|---|---|---|---|---|---|---|---|---|---|---|---|---|---|---|---|---|---|---|---|---|---|
| 0225560 | 0100 | 0000 | 9010 | 3ffe | 1080 | 002e | 0100 | 0000 | 2100 | 00f7 | e004 | 224c | e204 | 0000 | e404 | 6010 | e427 | bffc | e607 | bffc | 8090 | 0013 | 0280 | 0021 |
| 0225640 | 0100 | 0000 | d007 | bff8 | d202 | 2004 | d4c7 | bffc | d002 | 8000 | 4000 | 9d5b | 0100 | 0000 | 8090 | 0008 | 1280 | 0013 | 0100 | 0000 | d607 | bffc | d84a | e010 |
| 0225720 | 9a10 | 000c | 80a3 | 6072 | 1280 | 000d | 0100 | 0000 | d007 | bffc | d237 | a044 | d402 | 4000 | d422 | 2014 | d607 | bffc | d807 | a044 | da03 | 0000 | da22 | e018 |
| 0226000 | 9010 | 2000 | 1080 | 000b | 0100 | 0000 | de07 | bffc | e003 | e01c | e027 | bffc | 10bf | ffdf | 0100 | 0000 | 9010 | 3ffe | 1080 | 0003 | 0100 | 0000 | 9010 | 2000 |
| 0226060 | b010 | 00c8 | 81c7 | e008 | 81e8 | 0000 | 033f | ffff | 9200 | 63a0 | 9de3 | 8001 | f027 | a044 | d007 | a044 | 8090 | 0008 | 0280 | 0006 | 0100 | 0000 | d207 | a044 |
| 0226140 | d002 | 6004 | 4000 | 4677 | 0100 | 0000 | 9010 | 2000 | b010 | 0008 | 81c7 | e008 | 81e8 | 0000 | 033f | ffff | 8200 | 6390 | 9de3 | 8001 | f027 | a044 | 1100 | 00f7 |
| 0226220 | d002 | 224c | 8090 | 0008 | 0280 | 0006 | 0100 | 0000 | 1207 | a044 | 8090 | 0009 | 1280 | 0004 | 0100 | 0000 | 1080 | 0056 | 0100 | 0000 | d407 | a044 | 1700 | 00f7 |
| 0226300 | d602 | e24c | 80a2 | 800b | 1280 | 0008 | 0100 | 0000 | 9010 | 2000 | 9210 | 2046 | 1500 | 00fa | 9412 | a303 | 7fff | f1d3 | 0100 | 0000 | d807 | a044 | da03 | 200c |
| 0226360 | da27 | bff0 | 1f00 | 00f7 | de03 | e24c | d203 | e004 | d007 | bff0 | 4000 | 2bec | 0100 | 0000 | d027 | bff4 | e007 | bff4 | e24c | 2010 | a410 | 0011 | 80a4 | a077 |
| 0226440 | 1280 | 0004 | 0100 | 0000 | 1080 | 0038 | 0100 | 0000 | 2700 | 00f7 | e604 | e24c | e804 | c000 | ea05 | 2014 | ea27 | bffc | ec07 | bffc | 8090 | 0016 | 0280 | 002c |
| 0226520 | 0100 | 0000 | d007 | bffc | d202 | 200c | d227 | bff8 | d407 | bff8 | 8090 | 000a | 0280 | 0020 | 0100 | 0000 | d007 | bff8 | d202 | 2018 | d407 | bff0 | 80a2 | 400a |
| 0226600 | 1280 | 0015 | 0100 | 0000 | d007 | bff8 | d207 | a044 | d402 | 400c | d422 | 200c | d607 | bff8 | d807 | a044 | da03 | 0000 | da22 | e010 | de07 | bff8 | d003 | e004 |
| 0226660 | e007 | a044 | e204 | 0000 | d204 | 6008 | 4000 | 9cc7 | 0100 | 0000 | e407 | bff8 | c024 | a018 | 1080 | 000f | 0100 | 0000 | e607 | bff8 | e804 | e01c | e827 | bff8 |
| 0226740 | 10bf | ffe0 | 0100 | 0000 | ea07 | bffc | ec05 | 6010 | ec27 | bffc | 10bf | ffd4 | 0100 | 0000 | 1080 | 0003 | 0100 | 0000 | 9010 | 2000 | b010 | 0008 | 81c7 | e008 |
| 0227020 | 81e8 | 0000 | 033f | ffff | 8200 | 6388 | 9de3 | 8001 | f027 | a044 | 1100 | 00f7 | d002 | 224c | 8090 | 0008 | 1280 | 0004 | 0100 | 0000 | 1080 | 0117 | 0100 | 0000 |
| 0227100 | 1300 | 00f7 | d202 | 624c | d402 | 4000 | d427 | bffc | 1700 | 00f7 | d602 | e24c | d202 | e004 | d007 | a044 | 4000 | 2b95 | 0100 | 0000 | d027 | bff0 | d807 | bff0 |
| 0227160 | da4b | 2010 | da2f | bfeb | de4f | bfeb | a010 | 000f | 80a4 | 2061 | 1280 | 0004 | 0100 | 0000 | a210 | 2077 | e22f | bfeb | e407 | bffc | e604 | a014 | e627 | bff8 |
| 0227240 | e807 | bff8 | 8090 | 0014 | 0280 | 0010 | 0100 | 0000 | ea07 | bff0 | d205 | 6004 | ec07 | bff8 | d005 | 8000 | 4000 | 9c98 | 0100 | 0000 | 8090 | 0008 | 0280 | 0007 |
| 0227320 | 0100 | 0000 | ec07 | bff8 | f005 | e010 | f027 | bff8 | 10bf | fff0 | 0100 | 0000 | f207 | bff8 | 8090 | 0019 | 1280 | 007c | 0100 | 0000 | d007 | bffc | d202 | 2014 |
| 0227400 | 8090 | 0009 | 1280 | 000f | 0100 | 0000 | 1100 | 00f7 | d002 | 224c | d202 | 2004 | 9010 | 2014 | 4000 | 45fd | 0100 | 0000 | d207 | bffc | d022 | 6014 | d407 | bffc |
| 0227460 | d602 | a014 | c022 | e010 | 1080 | 0011 | 0100 | 0000 | d007 | bffc | d202 | 2014 | d227 | bff8 | 1500 | 00f7 | d402 | a24c | d202 | a004 | 9010 | 2014 | 4000 | 45ed |
| 0227540 | 0100 | 0000 | d607 | bffc | d022 | e014 | d807 | bffc | da03 | 2014 | de07 | bff8 | de23 | 6010 | e007 | bff0 | d004 | 2004 | 4000 | 9c6d | 0100 | 0000 | 9002 | 2001 |
| 0227620 | 2300 | 00f7 | e204 | 624c | d204 | 6004 | 4000 | 45dd | 0100 | 0000 | e407 | bffc | e604 | a014 | d024 | c000 | e807 | bffc | ea05 | 2014 | d005 | 4000 | ec07 | bff0 |
| 0227700 | d205 | a004 | 4000 | 9c45 | 0100 | 0000 | ee07 | bff0 | d005 | c000 | 4000 | 2b77 | 0100 | 0000 | 9410 | 0008 | f007 | bff0 | d006 | 2004 | 3300 | 00f7 | f206 | 624c |
| 0227760 | d606 | 6004 | 1300 | 00fa | 9212 | 6331 | 4000 | 1166 | 0100 | 0000 | d027 | bfec | 3500 | 00f7 | f406 | a24c | d206 | a004 | 9010 | 2002 | 4000 | 45be | 0100 | 0000 |
| 0230040 | f607 | bffc | f806 | e014 | d027 | 2008 | fa07 | bffc | d007 | 6014 | d002 | 2008 | 1300 | 00fa | 9212 | 6332 | 4000 | 9c26 | 0100 | 0000 | d207 | bfec | d402 | 6004 |
| 0230120 | 8090 | 000a | 1280 | 0018 | 0100 | 0000 | d007 | bff0 | d002 | 2004 | 4000 | 9c35 | 0100 | 0000 | 9002 | 2001 | 1300 | 00f7 | d202 | 624c | d202 | 6004 | 4000 | 45a5 |
| 0230200 | 0100 | 0000 | d407 | bffc | d602 | a014 | d022 | e004 | d807 | bffc | da03 | 2014 | d003 | 6004 | de07 | bff0 | d203 | e004 | 4000 | 9c0d | 0100 | 0000 | 1080 | 0007 |
| 0230260 | 0100 | 0000 | e007 | bffc | e204 | 2014 | e407 | bfec | e604 | a004 | e624 | 6004 | e807 | bffc | ea05 | 2014 | c025 | 600c | ec07 | bffc | ee05 | a014 | ee27 | bff8 |
| 0230340 | f007 | bff8 | f206 | 200c | 8090 | 0019 | 1280 | 000f | 0100 | 0000 | 1100 | 00f7 | d002 | 224c | d202 | 2004 | 9010 | 2020 | 4000 | 4583 | 0100 | 0000 | d207 | bff8 |
| 0230420 | d022 | 600c | d407 | bff8 | d602 | a00c | c022 | e01c | 1080 | 0011 | 0100 | 0000 | d007 | bff8 | d202 | 200c | d227 | bff4 | 1500 | 00f7 | d402 | a24c | d202 | a004 |
| 0230500 | 9010 | 2020 | 4000 | 4573 | 0100 | 0000 | d607 | bff8 | d022 | e00c | d807 | bff8 | da03 | 200c | de07 | bff4 | de23 | 601c | e007 | bff0 | d004 | 2008 | 4000 | 9bf3 |
| 0230560 | 0100 | 0000 | 9002 | 2001 | 2300 | 00f7 | e204 | 624c | d204 | 6004 | 4000 | 4563 | 0100 | 0000 | e407 | bff8 | e604 | a00c | d024 | c000 | e807 | bff8 | ea05 | 200c |
| 0230640 | d005 | 4000 | ec07 | bff0 | d205 | a008 | 4000 | 9bcb | 0100 | 0000 | 2f00 | 00f7 | ee05 | e24c | d205 | e004 | 9010 | 200d | 4000 | 4553 | 0100 | 0000 | f007 | bff8 |
| 0230720 | f206 | 200c | d026 | 6004 | f407 | bff8 | f606 | a00c | f84f | bfeb | f82e | e008 | fa07 | bff8 | d007 | 600c | c022 | 200c | d207 | bff8 | d402 | 600c | c022 | a010 |
| 0231000 | d607 | bff8 | d802 | e00c | da07 | a044 | da23 | 2018 | de4f | bfeb | a010 | 000f | 80a4 | 2072 | 1280 | 0014 | 0100 | 0000 | d007 | bff8 | d202 | 200c | d002 | 6004 |
| 0231060 | 1300 | 00fa | 9212 | 6333 | 4000 | 9ba8 | 0100 | 0000 | 1500 | 00f7 | d402 | a24c | d202 | a004 | d607 | bff0 | d002 | c000 | 4000 | 0f55 | 0100 | 0000 | d807 | bff8 |
| 0231140 | d023 | 2008 | 1080 | 000b | 0100 | 0000 | da07 | bff8 | de03 | 600c | d003 | e004 | 2100 | 00f7 | e004 | 224c | e204 | 0000 | d204 | 6008 | 4000 | 9b94 | 0100 | 0000 |
| 0231220 | 9010 | 2000 | b010 | 0008 | 81c7 | e008 | 81e8 | 0000 | 033f | ffff | 8200 | 6388 | 9de3 | 8001 | f027 | a044 | 9010 | 2001 | d027 | bff8 | d007 | a044 | 8090 | 0008 |
| 0231300 | 1280 | 0005 | 0100 | 0000 | 9010 | 2000 | 1080 | 008b | 0100 | 0000 | d007 | a044 | 4000 | 08e2 | 0100 | 0000 | d207 | a044 | d402 | 4000 | d427 | bffc | 9010 | 2400 |
| 0231360 | 4000 | 44b4 | 0100 | 0000 | 1700 | 0128 | d022 | e254 | 9010 | 21fc | 1300 | 0128 | d202 | 6254 | 4000 | 4501 | 0100 | 0000 | 1900 | 0128 | d023 | 2258 | 1b00 | 0128 |
| 0231440 | da03 | 6258 | c023 | 61f4 | 1f00 | 0128 | de03 | e258 | c023 | e1f8 | 2100 | 0128 | e004 | 2258 | 2300 | 0128 | e024 | 625c | 2500 | 0128 | e404 | a25c | e604 | a1f4 |
| 0231520 | 2900 | 0128 | e805 | 225c | aa05 | 0013 | ea27 | bfec | 2d00 | 00fa | ac15 | a340 | ec27 | bff0 | ee07 | bff0 | f04d | c000 | b210 | 0018 | 8090 | 0019 | 0280 | 000e |
| 0231600 | 0100 | 0000 | f407 | bfec | f607 | bff0 | f84e | c000 | f82e | 8000 | fa07 | bff0 | ba07 | 6001 | fa27 | bff0 | d007 | bfec | 9002 | 2001 | d027 | bfec | 10bf | fff0 |
| 0231660 | 0100 | 0000 | 1300 | 0128 | d202 | 625c | d402 | 61f4 | 9402 | a00d | d422 | 61f4 | d007 | bffc | 4000 | 004e | 0100 | 0000 | 1700 | 0128 | d602 | e258 | 1900 | 0128 |
| 0231740 | d623 | 225c | 1b00 | 0128 | da03 | 625c | 8090 | 000d | 0280 | 000f | 0100 | 0000 | 1f00 | 0128 | de03 | e25c | e003 | e1f4 | e207 | bff8 | a204 | 4010 | e227 | bff8 |
| 0232020 | 2500 | 0128 | e404 | a25c | e604 | a1f8 | 2900 | 0128 | e625 | 225c | 10bf | fff0 | 0100 | 0000 | ea07 | a044 | d205 | 6004 | d007 | bff8 | 9002 | 2001 | d027 | bff8 |
| 0232100 | 4000 | 44b4 | 0100 | 0000 | 2d00 | 0128 | d025 | a250 | d027 | bff4 | 2f00 | 0128 | ee05 | e258 | 3100 | 0128 | ee26 | 225c | 3300 | 0128 | f206 | 625c | 8090 | 0019 |
| 0232160 | 0280 | 0017 | 0100 | 0000 | 1100 | 0128 | d002 | 225c | d402 | 21f4 | 1300 | 0128 | d202 | 625c | d007 | bff4 | 4000 | 9b4b | 0100 | 0000 | 1300 | 0128 | d202 | 625c |
| 0232240 | d402 | 61f4 | d607 | bff4 | 9602 | c00a | d627 | bff4 | 1900 | 0128 | d803 | 225c | da03 | 21f8 | 1f00 | 0128 | da23 | e25c | 10bf | ffe8 | 0100 | 0000 | e007 | bff4 |
| 0232320 | c02c | 0000 | 1100 | 0128 | d002 | 2254 | 4000 | 4459 | 0100 | 0000 | 1100 | 0128 | d002 | 2250 | 1080 | 0003 | 0100 | 0000 | 9010 | 2000 | b010 | 0008 | 81c7 | e008 |
| 0232400 | 81e8 | 0000 | 033f | ffff | 8200 | 6390 | 9de3 | 8001 | f027 | a044 | 9010 | 2054 | 4000 | 00f2 | 0100 | 0000 | d007 | a044 | d002 | 0000 | 4000 | 0119 | 0100 | 0000 |
| 0232460 | d207 | a044 | d002 | 6004 | 4000 | 0115 | 0100 | 0000 | d407 | a044 | d002 | a008 | 4000 | 0111 | 0100 | 0000 | d607 | a044 | d802 | e00c | d827 | bffc | da07 | bffc |
| 0232540 | 8090 | 000d | 0280 | 0028 | 0100 | 0000 | d007 | bffc | d24a | 2010 | 9410 | 0009 | 80a2 | a044 | 0280 | 000b | 0100 | 0000 | d607 | bffc | d84a | e010 | 9a10 | 000c |
| 0232620 | 80a3 | 6058 | 0280 | 0005 | 0100 | 0000 | d007 | bffc | 4000 | 003e | 0100 | 0000 | de07 | bffc | e04b | e010 | a210 | 0010 | 80a4 | 6054 | 1280 | 0005 | 0100 | 0000 |

```
0232700 e407 bffc a610 2044 e62c a010 e807 bffc ea4d 2010 ac10 0015 80a5 a04e 1280 0005 0100 0000 ee07 bffc b010 2058 f02d e010
0232760 f207 bffc f406 6014 f427 bffc 10bf ffd8 0100 0000 f607 a044 f806 e010 f827 bff8 fa07 bff8 9090 001d 0280 000a 0100 0000
0233040 d027 bff8 4000 003b 010c 0009 d007 bff8 4202 201c d227 bff8 10bf fff6 0100 0000 d407 a044 d602 a014 d627 bff4 d807 bff4
0233120 8090 000c 0280 000a 0100 0000 d007 bff4 4000 004e 0100 0000 da07 bff4 de03 6010 de27 bff4 10bf fff6 0100 0000 9010 205c
0233200 4000 0098 0100 0000 9010 2000 b010 0008 81c7 e008 81e8 0000 033f ffff 8200 63a0 9de3 8001 f027 a044 9010 204f 4000 008d
0233260 0100 0000 d007 a044 d002 0000 4000 00b4 0100 0000 d207 a044 d002 6004 4000 00b0 0100 0000 d407 a044 d002 a008 4000 00ac
0233340 0100 0000 d607 a044 d002 e00c 4000 00a8 0100 0000 9010 205c 4000 007a 0100 0000 9010 2000 b010 0008 81c7 e008 81e8 0000
0233420 033f ffff 8200 63a0 9de3 8001 f027 a044 9010 2046 4000 006f 0100 0000 d007 a044 d002 0000 4000 0096 0100 0000 d207 a044
0233500 d002 6004 4000 0092 0100 0000 d407 a044 d002 a008 4000 008e 0100 0000 d607 a044 d002 e00c 4000 008a 0100 0000 d807 a044
0233560 d04b 2010 4000 005b 0100 0000 9010 205c 4000 0058 0100 0000 9010 2000 b010 0008 81c7 e008 81e8 0000 033f ffff 8200 6398
0233640 9de3 8001 f027 a044 9010 204c 4000 004d 0100 0000 d007 a044 d002 0000 4000 0074 0100 0000 d207 a044 d002 6004 4000 0070
0233720 0100 0000 d407 a044 d002 a008 4000 006c 0100 0000 d607 a044 d802 e00c d827 bffc da07 bffc 8090 000d 0280 0019 0100 0000
0234000 d007 bffc d24a 2014 9410 0009 80a2 a044 0280 0005 0100 0000 d007 bffc 4000 0017 0100 0000 d607 bffc d84a e008 9a10 000c
0234060 80a3 6077 1280 0005 0100 0000 de07 bffc a010 2044 e02b e014 e207 bffc e404 601c e427 bffc 10bf ffe7 0100 0000 9010 205c
0234140 4000 0020 0100 0000 9010 2000 b010 0008 81c7 e008 81e8 0000 033f ffff 8200 63a0 9de3 8001 f027 a044 9010 204d 4000 0015
0234220 0100 0000 d007 a044 d002 0000 4000 003c 0100 0000 d207 a044 d002 6004 4000 0038 0100 0000 d407 a044 d04a a008 4000 0009
0234300 0100 0000 9010 205c 4000 0006 0100 0000 9010 2000 b010 0008 81c7 e008 81e8 0000 033f ffff 8200 63a0 9de3 8001 f02f a047
0234360 1100 0128 d002 225c d202 21f4 90a2 61f4 0680 0015 0100 0000 9010 21fc 1300 0128 d202 6254 4000 437f 0100 0000 1300 0128
0234440 d202 625c d022 61f8 1500 0128 d402 a25c d602 a1f8 1900 0128 d623 225c 1b00 0128 da03 625c c023 61f4 1f00 0128 de03 e25c
0234520 c023 e1f8 2100 0128 e004 225c e204 21f4 a204 6001 e224 21f4 a424 6001 2700 0128 e604 e25c e84f a047 e82c c012 9010 2000
0234600 b010 0008 81c7 e008 81e8 0000 033f ffff 8200 6398 9de3 8001 9010 0018 4000 99e7 0100 0000 9002 2001 d027 bffc 1300 0128
0234660 d202 625c d402 61f4 d607 bffc 9902 800b 80a3 21f4 0480 0015 0100 0000 9010 21fc 1300 0128 d202 6254 4000 434e 0100 0000
0234740 1300 0128 d202 625c d022 61f8 1500 0128 d402 a25c d602 a1f8 1900 0128 d623 225c 1b00 0128 da03 625c c023 61f4 1f00 0128
0235020 de03 e25c c023 e1f8 2100 0128 e004 225c e204 21f4 2500 0128 e404 a25c a604 8011 ba10 0013 e84e 0000 aa10 0014 8090 0015
0235100 0280 0008 0100 0000 ec4e 0000 ec2f 4000 b006 2001 ba07 6001 10bf fff7 0100 0000 b410 205c f42f 4000 3700 0128 f606 e25c
0235160 f807 bffc d006 e1f4 9002 001c d026 e1f4 9010 2000 b010 0008 81c7 e008 81e8 0000 033f ffff 8200 6398 9de3 8001 f027 a044
0235240 f227 a048 9010 2008 d207 a044 4000 4319 0100 0000 d027 bffc c027 bff8 fa07 a048 d04f 4000 9210 0008 80a2 605c 0280 000d
0235320 0100 0000 d44f 4000 9610 000a 8090 000b 0280 0008 0100 0000 d807 bff8 9803 2001 d827 bff8 ba07 6001 10bf fff2 0100 0000
0235400 d007 bff8 9002 2001 d207 a044 4000 4301 0100 0000 de07 bffc d023 c000 e007 bffc d004 0000 d207 a048 d407 bff8 4000 99a4
0235460 0100 0000 e207 bffc e404 4000 e607 bff8 c02c 8013 e84f 4000 aa10 0014 80a5 605c 1280 0008 0100 0000 c02f 4000 ba07 6001
0235540 d207 bffc fa22 6004 1080 0004 0100 0000 d407 bffc fa22 a004 d007 bffc 1080 0003 0100 0000 9010 2000 b010 0008 81c7 e008
0235620 81e8 0000 033f ffff 8200 6390 9de3 8001 f027 a044 f227 a048 f427 a04c d007 a048 d202 200c d227 bffc d407 a044 d202 a004
0235700 9010 2020 4000 4203 0100 0000 d607 a048 1022 e00c d807 a048 da03 200c de07 bffc de23 601c e007 a048 e204 200c e227 bffc
0235760 e407 a044 d004 a004 d207 a04c 7fff ffa5 0100 0000 d027 bff4 e607 bffc e807 bff4 ea05 0000 ea24 c000 ec07 bff4 ee05 a004
0236040 ee27 a04c f007 a044 d006 2004 d207 a04c 7fff ff98 0100 0000 d027 bff4 f207 bffc f407 bff4 f606 8000 f626 6004 f807 bff4
0236120 fa07 2004 fa27 a04c d007 bffc d207 a04c d44a 4000 d42a 2008 d607 a04c 9602 e001 d627 a04c d807 a04c da4b 0000 9e10 000d
0236200 80a3 e054 1280 001b 0100 0000 d007 a044 d202 2004 9010 2010 4000 429e 0100 0000 d027 bff8 d207 bff8 d407 a044 d602 a004
0236260 d622 6004 d007 bff8 d207 a04c 4000 0158 0100 0000 d027 a04c d807 bffc da07 bff8 de03 4000 de23 200c e007 bffc e207 bff8
0236340 e404 4000 e424 2010 1080 0006 0100 0000 d007 bffc c022 200c d207 bffc c022 6010 d407 bffc 9610 2050 d62a a014 d807 a04c
0236420 9803 2001 d827 a04c d007 a04c 1080 0003 0100 0000 9010 2000 b010 0008 81c7 e008 81e8 0000 033f ffff 8200 6398 9de3 8001
0236500 f027 a044 f227 a048 d007 a044 d202 0000 d402 600c d427 bffc d607 a044 d202 e004 9010 2018 4000 426b 0100 0000 d807 a044
0236560 da03 0000 d023 600c de07 a044 e003 c000 e204 200c e407 bffc e424 6014 e607 a044 e804 c000 ea05 200c ea27 bffc ec07 a044
0236640 d005 a004 d207 a048 7fff ff3a 0100 0000 d027 bff8 ee07 bffc f007 bff8 f206 0000 f225 c000 f407 bff8 f606 a004 f627 a048
0236720 f807 a044 d007 2004 d207 a048 7fff ff2d 0100 0000 d027 bff8 fa07 bffc d007 bff8 d202 0000 d227 6004 d407 bff8 d602 a004
0237000 d627 a048 d807 a044 d003 2004 d207 a048 7fff ff20 0100 0000 d027 bff8 da07 bffc de07 bff8 e003 c000 e023 6008 e207 bff8
0237060 e404 6004 e427 a048 e607 a044 d004 e004 d207 a048 7fff ff13 0100 0000 d027 bff8 e807 bffc ea07 bff8 ec05 4000 ec25 200c
0237140 ee07 bff8 f005 e004 f027 a048 f207 bffc b410 2050 f42e 6010 f607 a048 b606 e001 f627 a048 d007 a048 1080 0003 0100 0000
0237220 9010 2000 b010 0008 81c7 e008 81e8 0000 033f ffff 8200 6390 9de3 8001 f027 a044 f227 a048 d007 a044 d202 0000 d402 6010
0237300 d427 bffc d607 a044 d202 e004 9010 2020 4000 4210 0100 0000 d807 a044 da03 0000 d023 6010 de07 a044 e003 c000 e204 2010
0237360 e407 bffc e424 601c e607 a044 e804 c000 ea05 2010 ea27 bffc ec07 a044 d005 a004 d207 a048 7fff fedf 0100 0000 d027 bff4
0237440 ee07 bffc f007 bff4 f206 0000 f225 c000 f407 bff4 f606 a004 f627 a048 f807 a044 d007 2004 d207 a048 7fff fed2 0100 0000
0237520 d027 bff4 fa07 bffc d007 bff4 d202 0000 d227 6004 d407 bff4 d602 a004 d627 a048 d807 a044 d003 2004 d207 a048 7fff fec5
0237600 0100 0000 d027 bff4 da07 bffc de07 bff4 e003 c000 e023 6008 e207 bff4 e404 6004 e427 a048 e607 a044 d004 e004 d207 a048
0237660 7fff feb8 0100 0000 d027 bff4 e807 bffc ea07 bff4 ec05 4000 ec25 200c ee07 bff4 f005 e004 f027 a048 f207 bffc f407 a048
0237740 f64e 8000 f62e 6010 f807 a048 b807 2001 f827 a048 fa07 a048 d04f 4000 9210 0008 80a2 6054 1280 001b 0100 0000 d007 a044
```

```
0240020 d202 2004 9010 2010 4000 41be 0100 0000 d027 bff8 d207 bff8 d407 a044 d602 a004 d622 6004 d007 bff8 d207 a048 4000 0078
0240100 0100 0000 d027 a048 d807 bffc da07 bff8 de03 4000 de23 2014 e007 bffc e207 bff8 e404 4000 e424 2018 1080 0006 0100 0000
0240160 d007 bffc c022 2014 d207 bffc c022 6018 d407 a048 9402 a001 d427 a048 d007 a048 1080 0003 0100 0000 9010 2000 b010 0008
0240240 81c7 e008 81e8 0000 033f ffff 8200 6398 9de3 8001 f027 a044 f227 a048 d007 a044 d202 0000 d402 6014 d427 bffc d607 a044
0240320 d202 e004 9010 2014 4000 418e 0100 0000 d807 a044 da03 0000 d023 6014 de07 a044 e003 c000 e204 2014 e407 bffc e424 6010
0240400 e607 a044 e804 c000 ea05 2014 ea27 bffc ec07 bffc c025 a00c ee07 a044 d005 e004 d207 a048 7fff fe5b 0100 0000 d027 bff8
0240460 f007 bffc f207 bff8 f406 4000 f426 0000 f607 bff8 f806 e004 f827 a048 fa07 a044 d007 6004 d207 a048 7fff fe4e 0100 0000
0240540 d027 bff8 d007 bffc d207 bff8 d402 4000 d422 2004 d607 bff8 d802 e004 d827 a048 da07 a044 d003 6004 d207 a048 7fff fe41
0240620 0100 0000 d027 bff8 de07 bffc e007 bff8 e204 0000 e223 e008 e407 bff8 e604 a004 e627 a048 e807 a048 ea4d 0000 ac10 0015
0240700 80a5 a044 1280 000c 0100 0000 d407 a048 9402 a001 d427 a048 d207 bffc d007 a044 7fff fe6d 0100 0000 d027 a048 10bf fff2
0240760 0100 0000 ee07 a048 ae05 e001 ee27 a048 d007 a048 1080 0003 0100 0000 9010 2000 b010 0008 81c7 e008 81e8 0000 033f ffff
0241040 9200 6398 9de3 8001 f027 a044 f227 a048 d007 a048 d24a 0000 9410 0009 80a2 a054 0280 0005 0100 0000 d007 a048 1080 007a
0241120 0100 0000 d607 a048 9602 e001 d627 a048 d807 a044 d203 2004 9010 2018 4000 4129 0100 0000 da07 a044 d023 4000 de07 a044
0241200 e003 c000 e027 bffc e207 a044 d004 6004 d207 a048 7fff fdff 0100 0000 d027 bff8 e407 bffc e607 bff8 e804 c000 e824 8000
0241260 ea07 bff8 ec05 6004 ec27 a048 ee07 a044 d005 e004 d207 a048 7fff fdf2 0100 0000 d027 bff8 f007 bffc f207 bff8 f406 4000
0241340 f426 2004 f607 bff8 f806 e004 f827 a048 fa07 a044 d007 6004 d207 a048 7fff fde5 0100 0000 d027 bff8 d007 bffc d207 bff8
0241420 d402 4000 d422 2008 d607 bff8 d802 e004 d827 a048 da07 a044 de03 4000 c023 e00c e007 a044 e204 0000 c024 6010 e407 a044
0241500 e604 8000 c024 e014 e807 a048 ea4d 0000 ac10 0015 8090 0016 0280 0030 0100 0000 1080 001c 0100 0000 d007 a044 d207 a048
0241560 7fff fe71 0100 0000 d027 a048 1080 0025 0100 0000 d007 a044 d207 a048 7fff fec5 0100 0000 d027 a048 1080 001e 0100 0000
0241640 d007 a044 d207 a048 7fff ff40 0100 0000 d027 a048 1080 0017 0100 0000 1080 0015 0100 0000 d007 a048 1080 001b 0100 0000
0241720 d007 a048 9002 2001 d027 a048 9222 2001 d04a 4000 80a2 2000 02bf fff5 80a2 2046 02bf ffe5 80a2 204c 02bf ffea 80a2 204f
0242000 02bf ffda 0100 0000 10bf ffef 0100 0000 10bf ffce 0100 0000 d407 a048 9402 a001 d427 a048 d007 a048 1080 0003 0100 0000
0242060 9010 2000 b010 0008 81c7 e008 81e8 0000 033f ffff 8200 6398 9de3 8001 f027 a044 d007 a044 8090 0008 0280 0008 0100 0000
0242140 d207 a044 d44a 4000 9610 000a 80a2 e054 0280 0005 0100 0000 9010 2000 1080 001b 0100 0000 9010 2400 4000 404e 0100 0000
0242220 d027 bff8 9010 2010 d207 bff8 4000 409d 0100 0000 d027 bffc d807 bffc da07 bff8 da23 2004 de07 bffc c023 e00c e007 bffc
0242300 c024 2008 d007 bffc d207 a044 7fff ff54 0100 0000 d027 a044 d007 bffc 1080 0003 0100 0000 9010 2000 b010 0008 81c7 e008
0242360 81e8 0000 033f ffff 8200 6388 9de3 8001 f027 a044 1100 00f7 d002 224c 8090 0008 1280 0005 0100 0000 9010 2000 1080 00bc
0242440 0100 0000 d007 a044 4000 00bc 0100 0000 9010 2400 4000 4023 0100 0000 d027 bff8 9010 21fc d207 bff8 4000 4072 0100 0000
0242520 1300 0128 d022 6258 1500 0128 d402 a258 c022 a1f4 1700 0128 d602 e258 c022 e1f8 1900 0128 d803 2258 1b00 0128 d823 625c
0242600 de07 a044 e003 c000 a024 2001 e023 c000 8090 0010 0680 000b 0100 0000 e207 a044 e404 6004 a404 a001 e424 6004 a624 a001
0242660 e80c c000 aa10 0014 1080 0006 0100 0000 d007 a044 4000 96f5 0100 0000 aa10 0008 ea27 bff0 80a5 7fff 0280 0031 0100 0000
0242740 ec07 bff0 8090 0016 0280 002d 0100 0000 d007 bff0 80a2 200a 1280 0004 0100 0000 10bf ffe0 0100 0000 1300 0128 d202 625c
0243020 d402 61f4 9602 a001 90a2 e1f4 0480 0014 0100 0000 9010 21fc d207 bff8 4000 4039 0100 0000 1300 0128 d202 625c d022 61f8
0243100 1500 0128 d402 a25c d602 a1f8 1900 0128 d623 225c 1b00 0128 da03 625c c023 61f4 1f00 0128 de03 e25c c023 e1f8 2100 0128
0243160 e004 225c e204 21f4 a204 6001 e224 21f4 a424 6001 2700 0128 e604 e25c e807 bff0 e82c c012 10bf ffbb 0100 0000 ea07 bff0
0243240 80a5 7fff 1280 0008 0100 0000 d007 bff8 4000 3fe4 0100 0000 9010 2000 1080 0054 0100 0000 1100 0128 d002 2258 1300 0128
0243320 d022 625c c027 bfec 1500 0128 d402 a25c 8090 000a 0280 000f 0100 0000 1700 0128 d602 e25c d802 e1f4 da07 bfec 9a03 400c
0243400 da27 bfec 1f00 0128 de03 e25c e003 e1f8 2300 0128 e024 625c 10bf fff0 0100 0000 d007 bfec 9002 2001 d027 bfec d207 bff8
0243460 4000 3ff8 0100 0000 2500 0128 d024 a250 d027 bff4 2700 0128 e604 e259 2900 0128 e625 225c 2b00 0128 ea05 625c 8090 0015
0243540 0280 0017 0100 0000 1100 0128 d002 225c d402 21f4 1300 0128 d202 625c d007 bff4 4000 968f 0100 0000 1300 0128 d202 625c
0243620 d402 61f4 d607 bff4 9602 c00a d627 bff4 1900 0128 d803 225c da03 21f8 1f00 0128 da23 e25c 10bf ffe8 0100 0000 e007 bff4
0243700 c02c 0000 1100 0128 d002 2250 7fff ff1d 0100 0000 d027 bffc 8090 0008 0280 0005 0100 0000 e207 bffc e407 a044 e424 600c
0243760 d007 bff8 4000 3f93 0100 0000 d007 bffc 1080 0003 0100 0000 9010 2000 b010 0008 81c7 e008 81e8 0000 033f ffff 8200 6380
0244040 9de3 8001 f027 a044 9010 2001 d027 bfe4 9210 2001 d227 bfec 9410 2024 d42f bff0 d607 a044 d802 c000 9823 2001 d822 c000
0244120 8090 000c 0680 000b 0100 0000 da07 a044 de03 6004 9e03 e001 de23 6004 a023 e001 e20c 0000 a410 0011 1080 0006 0100 0000
0244200 d007 a044 4000 9645 0100 0000 a410 0008 e427 bfe8 80a4 bfff 0280 0035 0100 0000 d007 bfe8 80a2 200a 1280 0004 0100 0000
0244260 10bf ffe4 0100 0000 d207 bfe8 80a2 6024 1280 0005 0100 0000 c027 bfe4 10bf ffdd 0100 0000 d007 bfe4 8090 0008 0280 0004
0244340 0100 0000 10bf ff47 0100 0000 9227 a010 d407 bfec d607 bfe8 d62a 400a d807 bfec 9803 2001 d827 bfec da07 bfec 80a3 600d
0244420 1680 0004 0100 0000 10bf ffca 0100 0000 9027 a010 1300 00fa 9212 634e d407 bfec 4000 963b 0100 0000 8090 0008 0280 0008
0244500 0100 0000 9010 2001 d027 bfe4 9210 2001 d227 bfec 1080 0004 0100 0000 1080 0007 0100 0000 10bf ffb7 0100 0000 1080 0003
0244560 0100 0000 9010 2000 b010 0008 81c7 e008 81e8 0000 033f ffff 8200 6388 9de3 8001 f027 a044 d007 a044 1300 00fa 9212 635c
0244640 9410 200d 4000 00af 0100 0000 9010 2400 4000 3f04 0100 0000 d027 bff8 9010 21fc d207 bff8 4000 3f53 0100 0000 1300 0128
0244720 d022 6258 1500 0128 d402 a258 c022 a1f4 1700 0128 d602 e258 c022 e1f8 1900 0128 d803 2258 1b00 0128 d823 625c d007 a044
0245000 4000 2039 0100 0000 d027 bff0 80a2 3fff 0280 002b 0100 0000 de07 bff0 8090 000f 0280 0027 0100 0000 1100 0128 d002 225c
0245060 d202 21f4 9402 6001 80a2 a1f4 0480 0014 0100 0000 9010 21fc d207 bff8 4000 3f31 0100 0000 1300 0128 d202 625c d022 61f8
```

```
0245140  1500 0128 d402 a25c d602 a1f8 1900 0128 d623 225c 1b00 0128 da03 625c c023 61f4 1f00 0128 de03 e25c c023 e1f8 2100 0128
0245220  e004 225c e204 21f4 a204 6001 e224 21f4 a424 6001 2700 0128 e604 e25c e807 bff0 e82c c012 10bf ffd2 0100 0000 ea07 bff0
0245300  80a5 7fff 1280 0008 0100 0000 d0c7 bff8 4000 3edc 0100 0000 9010 2000 1080 005e 0100 0000 1100 0128 d002 2258 1300 0128
0245360  d022 625c c027 bfec 1500 0128 d402 a25c 8090 c00a c290 000f 0100 0000 1700 0128 d602 e25c d802 e1f4 da07 bfec 9a03 400c
0245440  da27 bfec 1f00 0128 de03 e25c e003 e1f8 2300 0128 e024 625c 10bf fff0 0100 0000 d007 bfec 9002 2001 d027 bfec d207 bff8
0245520  4000 3ef3 0100 0000 2500 0128 d024 a250 d027 bff4 2700 0128 e604 e258 2900 0128 e625 225c 2b00 0128 ea05 625c 8090 0015
0245600  0280 0017 0100 0000 1100 0128 d002 225c d402 21f4 1300 0128 d202 625c d007 bff4 4000 9587 0100 0000 1300 0128 d202 625c
0245660  d402 61f4 d607 bff4 9602 c00a d627 bff4 1900 0128 d803 225c da03 21f8 1f00 0128 da23 e25c 10bf ffe8 0100 0000 e007 bff4
0245740  c02c 0000 2300 0128 e204 6250 e44c 4000 a610 0012 80a4 e054 0280 0008 0100 0000 d007 bff8 4000 3e8f 0100 0000 9010 2000
0246020  1080 0011 0100 0000 1100 0128 d002 2250 7fff fe08 0100 0000 d027 bffc d007 bffc d207 a044 d222 200c d007 bff8 4000 3e81
0246100  0100 0000 d007 bffc 1080 0003 0100 0000 9010 2000 b010 0008 81c7 e008 81e8 0000 033f ffff 8200 6390 9de3 8001 f027 a044
0246160  f227 a048 f427 a04c d007 a04c 7fff f52d 0100 0000 d027 bffc c027 bff8 d007 a044 4000 1f95 0100 0000 d027 bff4 80a2 3fff
0246240  0280 0020 0100 0000 d007 bffc d207 bff8 d407 bff4 d42a 0009 d607 bff8 9602 e001 d627 bff8 d007 bffc d207 a048 d407 bff8
0246320  4000 9553 0100 0000 8090 0008 0280 0005 0100 0000 c027 bff8 1080 000c 0100 0000 d007 bff8 d207 a04c 80a2 0009 0680 0007
0246400  0100 0000 d007 bffc 4000 9548 0100 0000 1080 000a 0100 0000 10bf ffdd 0100 0000 d007 bffc 4000 9541 0100 0000 1080 0003
0246460  0100 0000 9010 2000 b010 0008 81c7 e008 81e8 0000 033f ffff 8200 6388 9de3 8001 f027 a044 1100 00f7 d002 22bc 8090 0008
0246540  0280 0006 0100 0000 d207 a044 8090 0009 1280 0004 0100 0000 1080 00a9 0100 0000 1100 00fa 9012 236a 7fff e6bc 0100 0000
0246620  d407 a044 d602 8000 d627 bffc d807 bffc da03 2004 8090 000d 0280 0031 0100 0000 d007 bffc d002 2004 4000 01da 0100 0000
0246700  d027 bfec d207 bfec d002 6004 4000 01d5 0100 0000 d027 bfec d407 bfec d002 a004 4000 01d0 0100 0000 d027 bfec d607 bfec
0246760  d002 c000 4000 9431 0100 0000 9002 2001 7fff f4cc 0100 0000 d027 bfe8 d807 bfec d203 0000 d007 bfe8 4000 94b0 0100 0000
0247040  d007 bfe8 4000 01bf 0100 0000 d027 bfec da07 bfec d003 6004 4000 01ba 0100 0000 d027 bfec de07 bfec d003 e004 4000 01b5
0247120  0100 0000 d027 bfec e007 bfec e204 2004 c02c 4000 1080 0005 0100 0000 2500 00fa a414 a37e e427 bfe8 e607 bffc d204 c000
0247200  1100 00fa 9012 237f d407 bfe8 7fff e10c 0100 0000 1100 00fa 9012 23a9 7fff e108 0100 0000 e807 bffc ea05 200c ea27 bff8
0247260  ec07 bff8 8090 0016 0280 0019 0100 0000 d007 bff8 d24a 2010 9410 0009 80a2 a058 0280 000e 0100 0000 d007 bff8 d402 2004
0247340  d207 bff8 d602 6008 d807 bff8 d803 200c da07 bff8 d203 4000 1100 00fa 9012 23dc 7fff e0ef 0100 0000 de07 bff8 e003 e014
0247420  e027 bff8 10bf ffe7 0100 0000 1100 00fa 9012 23fe 7fff e0e6 0100 0000 e207 bffc e404 6010 e427 bff4 e607 bff4 8090 0013
0247500  0280 0018 0100 0000 d007 bff4 d002 200c 4000 0036 0100 0000 9610 0008 d207 bff4 d44a 6010 d807 bff4 d803 2008 da07 bff4
0247560  da03 6004 de07 bff4 d203 c000 1100 00fb 9012 2030 7fff e0ce 0100 0000 e007 bff4 e204 201c e227 bff4 10bf ffe8 0100 0000
0247640  1100 00fb 9012 2057 7fff e0c5 0100 0000 e407 bffc e604 a014 e627 bff0 e807 bff0 8090 0014 0280 000f 0100 0000 d007 bff0
0247720  d202 2008 d407 bff0 d402 a004 1100 00fb 9012 2076 7fff e0b6 0100 0000 d607 bff0 d802 e010 d827 bff0 10bf fff1 0100 0000
0250000  1100 00fb 9012 209e 7fff e0ad 0100 0000 1080 0003 0100 0000 9010 2000 b010 0008 81c7 e008 81e8 0000 033f ffff 8200 63a0
0250060  9de3 8001 f027 a044 d007 a044 d24a 0000 9410 0009 80a2 a030 1280 000c 0100 0000 1100 0128 9012 2260 1300 00fb 9212 60bc
0250140  4000 941e 0100 0000 1100 0128 9012 2260 1080 0048 0100 0000 d007 a044 d24a 2002 1500 0128 d22a a260 d607 a044 d84a e003
0250220  1b00 0128 d82b 6261 9e10 202f 2100 0128 de2c 2262 e207 a044 e44c 6004 2700 0128 e42c e263 e807 a044 ea4d 2005 2d00 0128
0250300  ea2d a264 ae10 202f 3100 0128 ee2e 2265 f207 a044 f44e 4000 3700 0128 f42e e266 f807 a044 fa4f 2001 1100 0128 fa2a 2267
0250360  9210 2020 1500 0128 d22a a268 d607 a044 d84a e006 1b00 0128 d82b 6269 de07 a044 e04b e007 2300 0128 e02c 626a a410 203a
0250440  2700 0128 e42c e26b e807 a044 ea4d 2008 2d00 0128 ea2d a26c ee07 a044 f04d e009 3300 0128 f02e 626d b410 203a 3700 0128
0250520  f42e e26e f807 a044 fa4f 200a 1100 0128 fa2a 226f d207 a044 d44a 600b 1700 0128 d42a e270 1900 0128 c02b 2271 1100 0128
0250600  9012 2260 1080 0003 0100 0000 9010 2000 b010 0008 81c7 e008 81e8 0000 033f ffff 8200 6290 9de3 8001 f027 a044 f227 a048
0250660  f427 a04c d007 a044 d207 a048 d407 a04c 4000 1ac5 0100 0000 d027 bffc 8090 0008 0280 0007 0100 0000 d007 bffc 7fff f70e
0250740  0100 0000 1080 0005 0100 0000 9010 2000 1080 0034 0100 0000 d007 a04c d24a 0000 9410 0009 80a2 a072 1280 002a 0100 0000
0251020  1700 00f7 d602 e24c 9090 000b 0280 0025 0100 0000 9027 a110 1300 00fb 9212 60c9 4000 93aa 0100 0000 9027 a110 d207 a048
0251100  4000 93c4 0100 0000 9227 a110 d007 a044 1500 00fb 9412 a0cc 4000 1a9f 0100 0000 d027 bff8 8090 0008 0280 0012 0100 0000
0251160  d007 bff8 7fff f3c4 0100 0000 d027 bff4 8090 0008 0280 0008 0100 0000 d007 bff4 d207 bffc d222 200c d007 bff4 7fff f678
0251240  0100 0000 d007 bff8 4000 1ce2 0100 0000 d007 bffc 1080 0003 0100 0000 9010 2000 b010 0008 81c7 e008 81e8 0000 033f ffff
0251320  8200 6280 9de3 8001 f027 a044 1100 00f7 d002 224c 8090 0008 0280 0083 0100 0000 1100 00f7 d002 224c d202 2004 d007 a044
0251400  4000 226d 0100 0000 d027 bff0 d207 bff0 d44a 6010 9610 000a 80a2 e072 0280 0036 0100 0000 9027 a11c 1300 00fb 9212 60ce
0251460  4000 936a 0100 0000 9027 a11c d207 bff0 d202 6008 4000 9383 0100 0000 9227 a11c d407 bff0 d002 8000 1500 00fb 9412 a0d1
0251540  4000 1a5d 0100 0000 d027 bff4 8090 0008 0280 0021 0100 0000 9010 204e 7fff e64c 0100 0000 1100 00f7 d002 224c 7fff f7c5
0251620  0100 0000 d027 bfe8 d007 bfe8 d24a 0000 9410 0009 8090 000a 0280 000c 0100 0000 d607 bfe8 9602 e001 d627 bfe8 9822 e001
0251700  d04b 0000 d207 bff4 4000 1e94 0100 0000 10bf fff2 0100 0000 9010 2000 d207 bff4 4000 1e8e 0100 0000 d007 bff4 4000 1c91
0251760  0100 0000 da07 bff0 de4b 6010 a010 000f 80a4 2077 0280 003c 0100 0000 1100 00f7 d002 224c d202 0000 d402 6014 d427 bffc
0252040  d607 bffc 8090 000b 0280 0027 0100 0000 d007 bffc d202 200c d227 bff8 d407 bff8 8090 000a 0280 030f 0100 0000 d007 bff8
0252120  d202 2018 d407 a044 80a2 400a 1280 0004 0100 0000 1080 0007 0100 0000 d607 bff8 d802 e01c d827 bff8 10bf fff1 0100 0000
0252200  da07 bff8 8090 000d 0280 000a 0100 0000 de07 bff8 e003 e018 e207 a044 80a4 0011 1280 0004 0100 0000 1080 0007 0100 0000
```

```
0252260  e407 bffc e604 a010 e627 bffc 10bf ffd9 0100 0000 e807 bff8 8090 0014 0280 000a 0100 0000 ea07 bff8 ec05 6018 ee07 a044
0252340  30a5 8017 1280 0004 0100 0000 f007 bff8 c026 2018 d007 a044 4000 1c4e 0100 0000 d027 bfec d007 bfec 1080 0003 0100 0000
0252420  7010 2000 b010 c008 81c7 e008 81e8 0000 033f ffff 8200 6398 9de3 8001 f027 a044 9010 2008 7fff f2ff 0100 0000 d027 bffc
0252500  c027 bff8 d007 a044 d24a 0000 9410 0009 80a2 a020 0280 0006 0100 0000 9610 2001 d627 bff8 1080 0016 0100 0000 d007 a044
0252560  d24a 0000 9410 0009 8090 000a 0280 0010 0100 0000 d007 a044 9002 2001 d027 a044 d24a 0000 9410 0009 80a2 a020 0280 0006
0252640  0100 0000 9010 2001 d027 bff8 1080 0034 0100 0000 10bf ffee 0100 0000 d207 bffc d407 a044 d422 6004 d607 bffc d422 c000
0252720  d9c7 bff8 8090 000c 0280 0018 0100 0000 1007 bffc d202 2004 d44a 4000 9610 000a 8090 000b 0280 000f 0100 0000 d007 bffc
0253000  d202 2004 9202 6001 d222 2004 d44a 4000 9610 000a 80a2 e020 1280 0004 0100 0000 1080 0004 0100 0000 10bf ffee 0100 0000
0253060  1080 0005 0100 0000 d807 bffc da07 a044 da23 2004 d007 bffc 1080 0003 0100 0000 9010 2000 b010 0008 81c7 e008 81e8 0000
0253140  033f ffff 8200 6388 9de3 8001 f027 a044 9010 2400 4000 3bd3 0100 0000 d027 bffc 9010 2010 d207 bffc 4000 3c22 0100 0000
0253220  d027 bff8 d007 bff8 d207 a044 d402 4000 d422 c000 d607 bff8 c022 e004 d807 bff8 c033 2008 da07 bff8 9e10 2001 de33 600a
0253300  e007 bff8 c024 200c d007 bff8 d207 bffc 4000 00f4 0100 0000 e207 bff8 e227 bff4 e407 bff4 8090 0012 0280 0009 0100 0000
0253360  e607 bff4 c034 e00a e807 bff4 ea05 200c ea27 bff4 10bf fff7 0100 0000 ec07 bff8 ec27 bfec ee07 bfec 8090 0017 0280 0044
0253440  0100 0000 d007 bfec d252 200a 8090 0009 0280 0007 0100 0000 d007 bfec d202 200c d227 bfec 10bf fff4 0100 0000 d407 bfec
0253520  d427 bff0 d607 bff8 d627 bff4 d807 bff4 8090 000c 0280 0024 0100 0000 d007 bff4 d252 200a 8090 0009 1280 0007 0100 0000
0253600  d407 bff4 d607 bfec 80a2 800b 1280 0004 0100 0000 1080 001c 0100 0000 d807 bff4 d003 0000 da07 bfec d203 4000 4000 00f1
0253660  0100 0000 8090 0008 0280 0013 0100 0000 d007 bfec d252 2008 d407 bff4 d652 a008 80a2 c009 0680 0007 0100 0000 d807 bff4
0253740  9a10 2001 da33 200a 1080 0007 0100 0000 d007 bff0 9210 2001 d232 200a d407 bff4 d427 bff0 d607 bff4 d802 e00c d827 bff4
0254020  10bf ffd3 0100 0000 da07 bfec de03 600c de27 bfec 10bf ffbc 0100 0000 e007 bff8 e027 bff4 e207 bff4 8090 0011 0280 000f
0254100  0100 0000 d007 bff4 d252 200a 8090 0009 0280 0005 0100 0000 d407 bff4 d602 a004 c022 c000 d807 bff4 da03 200c da27 bff4
0254160  10bf fff1 0100 0000 d007 bffc 4000 3b71 0100 0000 9010 2009 b010 0008 81c7 e008 81e8 0000 033f ffff 8200 6389 9de3 8001
0254240  f027 a044 f237 a04a f427 a04c 9010 2010 4207 a04c 4000 3b97 0100 0000 d027 bffc d027 bff4 d007 bffc c022 200c d207 a044
0254320  d227 bff8 d407 bff8 8090 000a 0280 0069 0100 0000 d007 bff8 d202 0000 d402 6010 d427 bff0 d607 bff0 8090 000b 0280 0025
0254400  0100 0000 d007 bff0 d202 2014 8090 0009 0280 001b 0100 0000 9010 2010 d207 a04c 4000 3b7c 0100 0000 d207 bffc d022 600c
0254460  d407 bffc d602 a00c d627 bffc d807 bff0 da03 2014 de07 bffc da23 c000 e007 bffc e207 bff0 a404 6014 e424 2004 e607 bffc
0254540  e857 a04a e834 e008 ea07 bffc ac10 2001 ec35 600a ee07 bffc c025 e00c f007 bff0 f206 201c f227 bff0 10bf ffdb 0100 0000
0254620  f407 bff8 f606 8000 f806 e014 f827 bfec fa07 bfec 8090 001d 0280 0031 0100 0000 d007 bfec d202 200c d227 bfe8 d407 bfe8
0254700  8090 000a 0280 0025 0100 0000 d007 bfe8 1202 200c 8090 0009 0280 001b 0100 0000 9010 2010 d207 a04c 4000 3b4a 0100 0000
0254760  1207 bffc d022 600c d407 bffc d602 a00c d627 bffc d807 bfe8 da03 200c de07 bffc da23 c000 e007 bffc e207 bfe8 a404 600c
0255040  e424 2004 e607 bffc e857 a04a e834 e008 ea07 bffc ac10 2001 ec35 600a ee07 bffc c025 e00c f007 bfe8 f206 201c f227 bfe8
0255120  10bf ffdb 0100 0000 f407 bfec f606 a010 f627 bfec 10bf ffcf 0100 0000 f807 bff8 fa07 200c fa27 bff8 10bf ff97 0100 0000
0255200  d007 bff4 d002 200c 1080 0003 0100 0000 9010 2000 b010 0008 81c7 e008 81e8 0000 033f ffff 8200 6390 9de3 8001 f027 a044
0255260  f227 a048 4007 a044 d027 bffc 9210 2001 d237 bff2 d407 a044 d427 bff4 d607 bffc 8090 000b 0280 0021 0100 0000 d257 bff2
0255340  d007 bffc d407 a048 7fff ff6b 0100 0000 d027 bff8 8090 0008 0280 000f 0100 0000 d007 bff4 d207 bff8 d222 200c d407 bff4
0255420  d602 a00c 8090 000b 0280 0007 0100 0000 1007 bff4 d202 200c d227 bff4 10bf fff8 0100 0000 d407 bff8 d427 bffc d657 bff2
0255500  9602 e001 972a e010 973a e010 d637 bff2 10bf ffdf 0100 0000 1080 0003 0100 0000 9010 2000 b010 0008 81c7 e008 81e8 0000
0255560  033f ffff 8200 63a0 9de3 8001 f027 a044 f227 a048 d007 a044 d002 2008 d207 a048 d202 6008 4000 9163 0100 0000 8090 0008
0255640  0280 0005 0100 0000 9010 2000 1080 0012 0100 0000 d407 a044 d002 8000 d607 a048 d202 c000 4000 9157 0100 0000 8090 0008
0255720  0280 0005 0100 0000 9010 2000 1080 0006 0100 0000 9010 2001 1080 0003 0100 0000 9010 2000 b010 0008 81c7 e008 81e8 0000
0256000  033f ffff 8200 6380 9de3 8001 f027 a044 c027 bff0 9010 2000 d027 bff4 d027 bff8 d007 a044 d202 0000 9222 6001 d222 0000
0256060  8090 0009 0680 000b 0100 0000 d407 a044 1602 a004 9602 e001 d622 a004 9822 e001 da0b 0000 9e10 0004 1080 0006 0100 0000
0256140  d007 a044 4000 9141 0100 0000 9e10 0008 de27 bffc 80a3 ffff 1280 0004 0100 0000 1080 0044 0100 0000 e007 bffc e207 bff8
0256220  a21c 4010 e227 bff8 e407 a044 e604 8000 a624 e001 e624 8000 8090 0013 0680 000b 0100 0000 e807 a044 ea05 2004 aa05 6001
0256300  ea25 2004 ac25 6001 ee0d 8000 b010 0017 1080 0006 0100 0000 d007 a044 4000 912f 0100 0000 b010 0008 f027 bffc 80a6 3fff
0256360  1280 0004 0100 0000 1080 0026 0100 0000 f207 bffc f407 bff4 b41e 8013 f427 bff4 f607 a044 fa06 c000 b827 2001 f826 c000
0256440  8090 001c 0680 000b 0100 0000 fa07 a044 d007 6004 9002 2001 d027 6004 9222 2001 d40a 4000 9610 000a 1080 0006 0100 0000
0256520  d007 a044 4000 9111 0100 0000 9610 0008 d627 bffc 80a2 ffff 1280 0004 0100 0000 1080 0008 0100 0000 d807 bffc da07 bff0
0256600  9a1b 400c da27 bff0 10bf ffa6 0100 0000 de07 bff8 a12b e008 e207 bff4 a404 0011 a72c a008 e807 bff0 aa04 c014 ea27 bfec
0256660  7027 a020 1300 00fb 9212 60d3 d407 bfec 4000 90bd 0100 0000 c02f bfe8 9027 a020 1080 0003 0100 0000 9010 2000 b010 0008
0256740  81c7 e008 81e8 0000 033f ffff 8200 63c0 9de3 8001 f027 a044 f227 a048 d007 a044 d24a 0000 9410 0009 8090 000a 0280 0039
0257020  0100 0000 d007 a048 d24a 0000 d407 a044 d64a 8000 80a2 c009 0280 002a 0100 0000 d007 a044 d24a 0000 9410 0009 80a2 a020
0257100  0280 0010 0100 0000 d607 a044 d84a c000 9310 000c 80a3 602e 0280 000a 0100 0000 de07 a044 e04b c000 a210 0010 80a4 603a
0257160  0280 0004 0100 0000 1080 001e 0100 0000 e407 a048 e64c 8000 a810 0013 80a5 2020 0280 0010 0100 0000 ea07 a048 ec4d 4000
0257240  ae10 0016 80a5 e02e 0280 000a 0100 0000 f007 a048 f24e 0000 b410 0019 80a6 a03a 0280 0004 0100 0000 1080 000a 0100 0000
0257320  f607 a044 b606 e001 f627 a044 f807 a048 b807 2001 f827 a048 10bf ffc5 0100 0000 fa07 a048 d04f 4000 9210 0008 d407 a044
```

```
0257400  d04a 8000 9022 0009 1080 0003 0100 0000 9010 2000 b010 0008 81c7 e008 81e8 0000 033f ffff 8200 6398 9de3 8001 f027 a044
0257460  f227 a048 f42f a04f d007 a044 8090 0008 1280 0005 0100 0000 9010 2000 1080 0057 0100 0000 d24f a04f 9410 0009 80a2 a064
0257540  1280 0012 0100 0000 9010 2000 d207 a048 4000 3474 0100 0000 d027 bff8 d007 bff8 4000 34c0 0100 0000 d027 a048 d007 bff8
0257620  8090 0008 0280 0005 0100 0000 d007 bff8 4000 9072 0100 0000 d207 a044 d402 6010 d427 bffc d607 bffc 8090 000b 0280 0037
0257700  0100 0000 d04f a04f 9210 0008 80a2 606f 1280 000d 0100 0000 d407 bffc d002 8000 d207 a048 7fff ff81 0100 0000 8090 0008
0257760  1280 0005 0100 0000 d007 bffc 1080 002b 0100 0000 d64f a04f 9810 000b 80a3 2064 1280 000d 0100 0000 da07 bffc d003 4000
0260040  d207 a048 7fff ff71 0100 0000 8090 0008 1280 0005 0100 0000 d007 bffc 1080 001b 0100 0000 de4f a04f a010 000f 80a4 2066
0260120  1280 000d 0100 0000 e207 bffc d004 6004 d207 a048 7fff ff61 0100 0000 8090 0008 1280 0005 0100 0000 d007 bffc 1080 000b
0260200  0100 0000 e407 bffc e604 a01c e627 bffc 10bf ffc9 0100 0000 9010 2000 1080 0003 0100 0000 9010 2000 b010 0008 81c7 e008
0260260  81e8 0000 033f ffff 8200 6398 9de3 8001 f027 a044 f227 a048 f42f a04f d007 a044 8090 0008 1280 0005 0100 0000 9010 2000
0260340  1080 0057 0100 0000 d24f a04f 9410 0009 80a2 a064 1280 0012 0100 0000 9010 2000 d207 a048 4000 340f 0100 0000 d027 bff8
0260420  d007 bff8 4000 345b 0100 0000 d027 a048 d007 bff8 8090 0008 0280 0005 0100 0000 d007 bff8 4000 900d 0100 0000 d207 a044
0260500  d402 6014 d427 bffc d607 bffc 8090 000b 0280 0037 0100 0000 d04f a04f 9210 0008 80a2 606f 1280 000d 0100 0000 d407 bffc
0260560  d002 8000 d207 a048 7fff ff1c 0100 0000 8090 0008 1280 0005 0100 0000 d007 bffc 1080 002b 0100 0000 d64f a04f 9810 000b
0260640  80a3 2064 1280 000d 0100 0000 da07 bffc d003 4000 d207 a048 7fff ff0c 0100 0000 8090 0008 1280 0005 0100 0000 d007 bffc
0260720  1080 001b 0100 0000 de4f a04f a010 000f 80a4 2066 1280 000d 0100 0000 e207 bffc d004 6004 d207 a048 7fff fefc 0100 0000
0261000  8090 0008 1280 0005 0100 0000 d007 bffc 1080 000b 0100 0000 e407 bffc e604 a010 e627 bffc 10bf ffc9 0100 0000 9010 2000
0261060  1080 0003 0100 0000 9010 2000 b010 0008 81c7 e008 81e8 0000 033f ffff 8200 6398 9de3 8001 f027 a044 f227 a048 d007 a044
0261140  8090 0008 1280 0005 0100 0000 9010 2000 1080 001d 0100 0000 d207 a044 d402 600c d427 bffc d607 bffc 8090 000b 0280 0012
0261220  0100 0000 d007 bffc d002 0000 d207 a048 4000 8fa0 0100 0000 8090 0008 1280 0005 0100 0000 d007 bffc 1080 000b 0100 0000
0261300  d207 bffc 1402 601c d427 bffc 10bf ffee 0100 0000 9010 2000 1080 0003 0100 0000 9010 2000 b010 0008 81c7 e008 81e8 0000
0261360  033f ffff 8200 63c0 9de3 8001 f027 a044 d007 a044 8090 0008 0280 0006 0100 0000 d207 a044 d002 600c 1080 0006 0100 0000
0261440  9010 2000 1080 0003 0100 0000 9010 2000 b010 0008 81c7 e008 81e8 0000 033f ffff 8200 63c0 9de3 8001 f027 a044 d007 a044
0261520  8090 0008 0280 0006 0100 0000 d207 a044 d002 6004 1080 0006 0100 0000 9010 2000 1080 0003 0100 0000 9010 2000 b010 0008
0261600  81c7 e008 81e8 0000 033f ffff 8200 63c0 9de3 8001 f027 a044 d007 a044 8090 0008 0280 0006 0100 0000 d207 a044 d002 6018
0261660  1080 0006 0100 0000 9010 2000 1080 0003 0100 0000 9010 2000 b010 0008 81c7 e008 81e8 0000 033f ffff 8200 63c0 9de3 8001
0261740  f027 a044 d007 a044 8090 0008 0280 0006 0100 0000 d207 a044 d002 6010 1080 0006 0100 0000 9010 2000 1080 0003 0100 0000
0262020  9010 2000 b010 0008 81c7 e008 81e8 0000 033f ffff 8200 63c0 9de3 8001 f027 a044 d007 a044 8090 0008 0280 0006 0100 0000
0262100  d207 a044 d002 6004 1080 0006 0100 0000 9010 2000 1080 0003 0100 0000 9010 2000 b010 0008 81c7 e008 81e8 0000 033f ffff
0262160  8200 6280 9de3 8001 f027 a044 f227 a048 f427 a04c f627 a050 d007 a04c 80a2 2002 1280 0016 0100 0000 9010 2000 d207 a048
0262240  4000 3328 0100 0000 d027 bffc d007 bffc 8090 0008 1280 0004 0100 0000 1080 00d2 0100 0000 d007 bffc 4000 336e 0100 0000
0262320  9210 0008 9027 a088 4000 8f00 0100 0000 1080 0071 0100 0000 d007 a04c 8090 0008 0280 001d 0100 0000 d007 a048 4000 04d3
0262400  0100 0000 1300 00fb 9212 60d9 4000 8ee7 0100 0000 d027 bffc 8090 0008 1280 0004 0100 0000 1080 00b8 0100 0000 d007 a048
0262460  4000 04c6 0100 0000 1300 00f7 d202 624c d602 6004 d407 bffc 1300 00fb 9212 60dc 4000 0411 0100 0000 d027 bff8 1080 003f
0262540  0100 0000 d007 a048 4000 8ef4 0100 0000 ba10 0008 d007 a044 4000 8ef0 0100 0000 9002 001d 9002 2002 4000 8f22 0100 0000
0262620  d207 a044 4000 8ed1 0100 0000 1300 00fb 9212 60de 4000 8eeb 0100 0000 d207 a048 4000 8ee8 0100 0000 1300 00fb 9212 60e0
0262700  4000 8eba 0100 0000 d027 bffc 8090 0008 1280 0004 0100 0000 1080 008b 0100 0000 d007 a048 4000 8ed5 0100 0000 ba10 0008
0262760  d007 a044 4000 8ed1 0100 0000 9002 001d 9002 2002 4000 8f03 0100 0000 d207 a044 4000 8eb2 0100 0000 1300 00fb 9212 60e3
0263040  4000 8ecc 0100 0000 d207 a048 4000 8ec9 0100 0000 1300 00f7 d202 624c d602 6004 d407 bffc 1300 00fb 9212 60e5 4000 03d2
0263120  0100 0000 d027 bff8 d407 bff8 d602 a004 9090 000b 1280 000b 0100 0000 d007 a048 4000 0476 0100 0000 9210 0008 9027 a088
0263200  4000 8e96 0100 0000 1080 0007 0100 0000 9027 a088 d807 bff8 d203 2004 4000 8e8f 0100 0000 d007 bffc 7fff fd56 0100 0000
0263260  9210 0008 9027 a114 4000 8e88 0100 0000 9027 a088 4000 0053 0100 0000 9210 0008 9027 a108 4000 8e81 0100 0000 9227 a088
0263340  9427 a108 d007 a050 4000 0113 0100 0000 9210 0008 9027 a088 4000 8e78 0100 0000 9227 a088 d007 a050 1500 00fb 9412 a0e7
0263420  7fff faa3 0100 0000 d027 bee8 8090 0008 0280 0033 0100 0000 c027 bee4 9027 a108 d207 bee4 d44a 0009 9610 000a 8090 000b
0263500  0280 000d 0100 0000 9827 a103 da07 bee4 d04b 000d d207 bee8 4000 19b0 0100 0000 de07 bee4 9e03 e001 de27 bee4 10bf fff0
0263560  0100 0000 9010 2000 d207 bee8 4000 19a7 0100 0000 c027 bee4 a027 a114 e207 bee4 e44c 0011 a610 0012 8090 0013 0280 000d
0263640  0100 0000 a827 a114 ea07 bee4 d04d c015 d207 bee8 4000 1999 0100 0000 ec07 bee4 ac05 a001 ec27 bee4 10bf fff0 0100 0000
0263720  9010 2000 d207 bee8 4000 1990 0100 0000 d007 bee8 7fff faba 0100 0000 d007 bffc 4000 8e5e 0100 0000 1080 0003 0100 0000
0264000  9010 2000 b010 0008 81c7 e008 81e8 0000 033f ffff 8200 63b8 9de3 8001 f027 a044 c027 bffc d007 a044 d24a 0000 9410 0009
0264060  8090 000a 0280 002b 0100 0000 d007 a044 d24a 0000 9410 0009 80a2 a020 1280 0017 0100 0000 d007 bffc 1300 0128 9212 6274
0264140  9410 202e d42a 0009 d607 bffc 9602 e001 d627 bffc d807 a044 da4b 0000 9e10 000d 80a3 e020 1280 0007 0100 0000 e007 a044
0264220  a004 2001 e027 a044 10bf fff7 0100 0000 1080 000e 0100 0000 e207 bffc 2500 0128 a414 a274 e607 a044 e84c c000 e82c 4012
0264300  ea07 a044 aa05 6001 ea27 a044 ec07 bffc ac05 a001 ec27 bffc 10bf ffd3 0100 0000 ee07 bffc 3100 0128 b016 2274 c02d c018
0264360  1100 0128 9012 2274 1080 0003 0100 0000 9010 2000 b010 0008 81c7 e008 81e8 0000 033f ffff 8200 63a0 9de3 8001 f027 a044
0264440  f227 a048 9010 202a 1300 0128 d02a 62f4 d007 a044 7fff ffb7 0100 0000 d207 a048 4000 0011 0100 0000 9410 0008 1100 0128
```

```
0264520  9012 22f5 1300 03fb 9212 60e9 4000 8d46 0100 0000 1100 0128 9012 22f4 1080 0003 0100 0000 9010 2000 b010 0008 81c7 e008
0264600  81e8 0000 033f ffff 8200 6398 9de3 8001 f027 a044 f227 a048 1100 0007 9012 2261 d027 bffc d007 a044 4000 8de4 0100 0000
0264660  1207 a044 9402 4008 d427 bff8 d607 a044 1807 bff8 80a2 c00c 0280 0017 0100 0000 d007 a044 d24a c000 9410 0009 d607 bffc
0264740  161a c00a 1627 bffc d807 bffc 9b2b 2008 de07 bffc 9e1b c00d de27 bffc e007 bffc a33c 2005 e407 bffc a41c 8011 e427 bffc
0265020  e607 a044 a604 e001 e627 a044 10bf ffe8 0100 0000 e807 bffc ab3d 201d ec07 bffc ac1d 8015 ec27 bffc ee07 bffc b12d e017
0265100  f207 bffc b21e 4018 f227 bffc f407 bffc b73e a013 f807 bffc b81f 001b f827 bffc fa07 bffc 912f 6011 d207 bffc 921a 4008
0265160  d227 bffc d407 bffc 973a a00d d807 bffc 981b 000b d827 bffc da07 bffc 9f2b 600b e007 bffc a01c 000f e027 bffc e207 bffc
0265240  a53c 6007 e607 bffc a61c c012 e627 bffc e807 bffc ab2d 2005 ec07 bffc ac1d 8015 ec27 bffc ee07 bffc b13d e003 f207 bffc
0265320  b21e 4018 f227 bffc f407 bffc b72e a001 f807 bffc b81f 001b f827 bffc fa07 bffc 8090 001d 1680 0005 0100 0000 d007 bffc
0265400  9220 0008 d227 bffc d407 a048 d607 bffc 9602 c00a d627 bffc d007 bffc 1080 0003 0100 0000 9010 2000 b010 0008 81c7 e008
0265460  91e8 0000 033f ffff 8200 6310 93e3 8001 f027 a044 f227 a048 f427 a04c c027 bffc d207 bffc 9202 6001 d227 bffc 9222 6001
0265540  d007 a048 7fff ff6b 0100 0000 9210 0008 1100 0128 9012 2374 4000 8d58 0100 0000 d007 a044 1300 0128 9212 6374 1500 00fb
0265620  9412 a0ec 4000 1459 0100 0000 d027 bf70 8090 0008 1280 0006 0100 0000 1100 0128 9012 2374 1080 0038 0100 0000 c027 bff4
0265700  d007 bf70 4000 17c8 0100 0000 d027 bff8 80a2 3fff 0280 0013 0100 0000 d007 bff8 8090 0008 0280 000f 0100 0000 d207 bff4
0265760  80a2 6080 1480 000b 0100 0000 9027 a08c d207 bff4 d407 bff8 d42a 0009 d607 bff4 9602 e001 d627 bff4 10bf ffea 0100 0000
0266040  9827 a08c da07 bff4 c02b 000d 1007 bf70 4000 1680 0100 0000 de07 bff4 80a3 e080 0480 0004 0100 0000 1080 000d 0100 0000
0266120  9027 a08c 1207 a04c 4000 9d32 0100 0000 9090 0008 1280 0006 0100 0000 1100 0128 9012 2374 1080 0008 0100 0000 e007 bffc
0266200  a004 2001 e027 bffc 10bf ffb2 0100 0000 9010 2000 b010 0008 81c7 e008 81e8 0000 033f ffff 8200 6380 9de3 8001 f027 a044
0266260  f227 a048 f427 a04c d007 a044 d207 a048 4000 0d67 0100 0000 d027 bffc 8090 0008 1280 0005 0100 0000 9010 2000 1080 00b0
0266340  0100 0000 d007 a048 d24a 0000 9410 0009 90a2 a077 0280 0005 0100 0000 d007 bffc 1080 00a7 0100 0000 d007 bffc 1300 00fb
0266420  9212 60ee 1500 00fb 9412 a0f8 4000 13ee 0100 0000 d027 bff8 d607 a04c d627 bfe4 d807 bfe4 da4b 0000 9e10 000d 8090 000f
0266500  0280 000c 0100 0000 e007 bfe4 a004 2001 e027 bfe4 a224 2001 d04c 4000 d207 bff8 4000 182e 0100 0000 10bf fff2 0100 0000
0266560  9010 2000 d207 bff8 4000 1828 0100 0000 2500 00f7 e404 a24c d204 a004 d007 bff8 4000 1bc9 0100 0000 d027 bfec d007 bff8
0266640  4000 1624 0100 0000 2700 00f7 e604 e24c e804 c000 ea05 2014 ea27 bff4 ec07 bff4 8090 0016 0280 0010 0100 0000 ee07 bfec
0266720  1205 e0c4 f007 bff4 1006 0000 4000 8c41 0100 0000 8090 0008 0280 0007 0100 0000 f207 bff4 f406 6010 f427 bff4 10bf fff0
0267000  0100 0000 f607 bff4 8090 001b 1280 0050 0100 0000 1100 00f7 d002 224c d202 0000 d402 6014 d427 bff0 1700 00f7 d602 e24c
0267060  d202 e004 9010 2014 4000 3636 0100 0000 d027 bff4 d807 bff4 da07 bff0 da23 2010 de07 bfec d003 e004 4000 8cb8 0100 0000
0267140  9002 2001 2100 00f7 e004 224c d204 2004 4000 3628 0100 0000 e207 bff4 d024 4000 e407 bfec d204 a004 e607 bff4 d004 c000
0267220  4000 8c92 0100 0000 d007 bffc 4000 1bc5 0100 0000 9410 0008 e807 bfec d005 2004 2b00 00f7 ea05 624c d605 6004 1300 00fb
0267300  9212 60fa 4000 01b4 0100 0000 d027 bfe8 ec07 bfe8 ee05 a004 8090 0017 1280 0016 0100 0000 d007 bfec d002 2004 4000 8c93
0267360  0100 0000 9002 2001 1300 00f7 d202 624c d202 6004 4000 3603 0100 0000 d407 bff4 d022 a004 d607 bff4 d002 e004 d807 bfec
0267440  d203 2004 4000 8c6d 0100 0000 1080 0006 0100 0000 da07 bff4 de07 bfe8 e003 e004 e023 6004 e207 bff4 c024 600c d007 a04c
0267520  4000 8c7a 0100 0000 9002 2001 2500 00f7 e404 a24c d204 a004 4000 35ea 0100 0000 e607 bff4 d024 e008 e807 bff4 d005 2008
0267600  d207 a04c 4000 8c55 0100 0000 d007 bffc 1080 0003 0100 0000 9010 2000 b010 0008 81c7 e008 81e8 0000 033f ffff 8200 6340
0267660  9de3 8001 f027 a044 f227 a048 9010 2001 d207 a048 4000 35d3 0100 0000 d027 bfa8 d007 bfa8 c02a 0000 d007 a044 1300 00fb
0267740  9212 60fb 1500 00fb 9412 a105 4000 133a 0100 0000 d027 bffc 8090 0008 1280 0005 0100 0000 d007 bfa8 1080 0026 0100 0000
0270020  c027 bfa4 1007 bffc 4000 16b3 0100 0000 d027 bfa0 80a2 3fff 0280 000b 0100 0000 9227 a054 d407 bfa4 d607 bfa0 d62a 400a
0270100  1807 bfa4 9803 2001 1827 bfa4 10bf fff2 0100 0000 d007 bffc 4000 1576 0100 0000 9027 a054 4000 8c35 0100 0000 9002 2001
0270160  1207 a048 4000 35a7 0100 0000 d027 bfa8 1227 a054 d007 bfa8 4000 8c14 0100 0000 d007 bfa8 1080 0003 0100 0000 9010 2000
0270240  b010 0008 81c7 e008 81e8 0000 033f ffff 9200 6380 9de3 8001 f027 a044 f227 a048 f427 a04c f627 a050 d007 a048 4000 8c1b
0270320  0100 0000 9002 2003 7fff ec16 0100 0000 1027 bfec d007 bfec 1300 00fb 9212 6107 4000 8bfa 0100 0000 d007 bfec d207 a048
0270400  4000 8c14 0100 0000 d007 a050 4000 8c0b 0100 0000 9002 2003 7fff ec06 0100 0000 d027 bfe8 d007 bfe8 1300 00fb 9212 610a
0270460  4000 8bea 0100 0000 d007 bfe8 1207 a050 4000 8c04 0100 0000 d007 a044 d207 bfec 1500 00fb 9412 a10d 4000 12df 0100 0000
0270540  1027 bffc 8090 0008 1280 000b 0100 0000 1007 bfec 4000 8c2d 0100 0000 d007 bfe8 4000 8c2a 0100 0000 9010 2002 1080 004d
0270620  0100 0000 d007 a04c d207 bfe8 1500 00fb 9412 a10f 4000 12cc 0100 0000 d027 bff8 8090 0008 1280 000e 0100 0000 d007 bfec
0270700  4000 8c1a 0100 0000 d007 bfe8 400c 8c17 0100 0000 d007 bffc 4000 1516 0100 0000 9010 3ffe 1080 0037 0100 0000 d007 bfec
0270760  4000 8c0e 0100 0000 d007 bfe8 4000 8c0b 0100 0000 d007 bffc 7fff f53f 0100 0000 d027 bff4 d007 bffc 4000 1506 0100 0000
0271040  d007 bff8 7fff f5d8 0100 0000 d027 bff0 1007 bff8 4000 14ff 0100 0000 d007 bff4 d202 0000 d002 6008 d407 bff0 d602 8000
0271120  d202 e008 4000 8bb3 0100 0000 d027 bfe4 d007 bff4 7fff ee76 0100 0000 d007 bff0 7fff ee73 0100 0000 d807 bfe4 8090 000c
0271200  0480 0005 0100 000c 9010 2001 1080 000d 0100 0000 da07 bfe4 8090 000d 1680 0005 0100 0000 9010 3fff 1080 0006 0100 0000
0271260  9010 2000 1080 0003 0100 0000 9010 2000 b010 0008 81c7 e008 81e8 0000 0000 0000 033f ffff 8200 63c0 9de3 8001 9006 4000
0271340  b206 6001 d24a 0000 d44e 0000 80a2 8009 1280 000e 0100 0000 9606 0000 b006 2001 d84a c000 9a10 000c 8090 000d 1280 0005
0271420  0100 0000 9010 2001 1080 0008 0100 0000 10bf ffef 0100 0000 9010 2000 1080 0003 0100 0000 9010 2000 b010 0008 81c7 e008
0271500  81e8 0000 033f ffff 8200 63c0 9de3 8001 9006 4000 b206 6001 d24a 0000 9406 0000 b006 2001 d64a 8000 80a2 c009 1280 0008
0271560  0100 0000 b426 a001 8090 001a 0680 0004 0100 0000 10bf fff3 0100 0000 8090 001a 0680 0005 0100 0000 9010 2001 1080 0003
```

```
0271640  0100 0000 9010 2000 1080 0003 0100 0000 9010 2000 b010 0008 81c7 e008 81e8 0000 033f ffff 8200 6389 9de3 8001 9027 a010
0271720  4000 8b99 0100 0000 d007 bff0 d207 bff4 9402 0009 d607 bff8 9802 800b da07 bffc 9e03 000d de27 bfec d007 bfec 912a 2003
0272000  a010 0008 a12c 2002 9022 0010 a12c 2005 9002 0010 9210 203c 4000 8b75 0100 0000 d027 bfec d007 bfec 1080 0003 0100 0000
0272060  9010 2000 b010 0008 81c7 e008 81e8 0000 033f ffff 8200 6390 9de3 8001 9027 a00c 4000 8b7c 0100 0000 d007 bff4 912a 2003
0272140  9210 0008 932a 6002 9022 0009 932a 6005 9002 0009 d417 bff8 9610 000a 9002 000b 1080 0003 0100 0000 9010 2000 b010 0008
0272220  81c7 e008 81e8 0000 033f ffff 8200 6398 9de3 8001 1100 00fb 9012 2218 4000 8b68 0100 0000 d027 bff8 9027 a008 4000 8b67
0272300  0100 0000 d027 bffc d007 bffc 9210 2020 d22a 2018 d007 bffc 1080 0003 0100 0000 9010 2000 b010 0008 81c7 e008 81e8 0000
0272360  033f ffff 8200 6390 9de3 8001 f027 a044 c027 bffc 9027 a004 4000 8b51 0100 0000 9027 a004 4000 8b54 0100 0000 d027 bff8
0272440  d007 bff8 d202 2004 d223 a05c d407 bff8 1602 8000 d623 a060 d807 bff8 d603 2010 9602 e001 da07 bff8 da03 6008 de07 bff8
0272520  d403 e014 e007 bff8 d804 200c 1300 00fb 9212 6220 d007 a044 4000 8ad3 0100 0000 e207 a044 c02c 600c d007 a044 1080 0003
0272600  0100 0000 9010 2000 b010 0008 81c7 e008 81e8 0000 033f ffff 8200 62d8 9de3 8001 f027 a044 f227 a048 f427 a04c f627 a050
0272660  c027 bff0 9010 2010 d207 a050 4000 3455 0100 0000 d027 bffc d007 bffc c022 200c d207 bffc c022 6008 d407 bffc c022 a004
0272740  d607 bffc c022 c000 d807 a04c da4b 2012 9e10 000d de27 bff8 9010 2040 d207 a050 4000 3444 0100 0000 d027 bff4 d007 bff8
0273020  d207 bff4 4000 8b17 0100 0000 8090 0008 1280 002e 0100 0000 d007 bff4 d202 2004 d227 bfec 9027 a038 1300 00fb 9212 623f
0273100  d407 bfec 4000 8a9c 0100 0000 c02f bfd4 d407 bffc d607 bff4 d802 e014 d822 a00c da07 bff4 de03 6020 de27 bff0 9027 a010
0273160  4000 8afd 0100 0000 d027 bfe8 e007 bfe8 e204 2004 e223 a05c e407 bfe8 e604 8000 e623 a060 9027 a028 e807 bfe8 d605 2010
0273240  9602 e001 ea07 bfe8 d405 6014 ec07 bfe8 d805 a00c ee07 bfe8 da05 e008 1300 00fb 9212 6242 4000 8a7c 0100 0000 c02f bfe4
0273320  1080 000c 0100 0000 9027 a038 1300 00fb 9212 6261 4000 8a7d 0100 0000 9027 a028 1300 00fb 9212 626e 4000 8a78 0100 0000
0273400  9027 a038 4000 8a8d 0100 0000 9002 2001 d207 a050 4000 33ff 0100 0000 d207 bffc d022 4000 9227 a038 d407 bffc d002 8000
0273460  4000 8a6a 0100 0000 9027 a028 4000 8a7f 0100 0000 9002 2001 d207 a050 4000 33f1 0100 0000 d607 bffc d022 e008 d807 bffc
0273540  d003 2008 9227 a028 4000 8a5c 0100 0000 d007 bffc 1080 0003 0100 0000 9010 2000 b010 0008 81c7 e008 81e8 0000 033f ffff
0273620  8200 6398 9de3 8001 f027 a044 d007 a044 9090 0008 1280 0005 0100 0000 9010 2001 1080 0023 0100 0000 d007 a044 1300 00fb
0273700  9212 627b 4000 8a39 0100 0000 d027 bffc d207 bffc 8090 0009 1280 0005 0100 0000 9010 2002 1080 0016 0100 0000 d007 bffc
0273760  4000 8a5e 0100 0000 d007 a044 4000 8aa0 0100 0000 d027 bff8 d407 bff8 8090 000a 0280 0007 0100 0000 1100 00fb 9012 227d
0274040  d207 a044 4000 8a4e 0100 0000 d007 bff8 1080 0003 0100 0000 9010 2000 b010 0008 81c7 e008 81e8 0000 033f ffff 8200 6188
0274120  9de3 8001 f027 a044 1100 00fc d002 20d4 8090 0008 1280 0057 0100 0000 1100 00fc 9012 20d8 1300 00fc 9212 60df 4000 8a0b
0274200  0100 0000 d027 bdec 8090 0008 1280 000e 0100 0000 1100 011e 9012 22c8 1300 00fc 9212 60e1 1500 00fc 9412 a123 d607 a044
0274260  4000 8a07 0100 0000 d007 a044 1080 005b 0100 0000 9010 2400 4000 333e 0100 0000 d027 bdf0 1100 00fc 9012 20d4 d207 bdf0
0274340  9410 2001 4000 0206 0100 0000 9027 a208 9210 2100 d407 bdec 4000 89f2 0100 0000 8090 0008 0280 002c 0100 0000 9027 a208
0274420  9427 a084 9627 a108 1300 00fc 9212 612a 4000 8a2d 0100 0000 80a2 2002 0280 000d 0100 0000 1100 011e 9012 22c8 1300 00fc
0274500  9212 612f 1500 00fc 9412 a151 4000 89e0 0100 0000 d007 a044 1080 0034 0100 0000 9027 a108 4000 89f5 0100 0000 9002 2001
0274560  d207 bdf0 4000 3367 0100 0000 d027 bdf4 9227 a108 d007 bdf4 4000 89d4 0100 0000 9427 a084 1300 00fc d202 60d4 d007 bdf4
0274640  9610 2000 4000 01fb 0100 0000 13bf ff40 0100 0000 d007 bdec 4000 89ec 0100 0000 9027 a20c 1300 00fc d202 60d4 d407 a044
0274720  9610 2000 4000 0202 0100 0000 80a2 2001 1280 0005 0100 0000 d007 bdf4 1080 000f 0100 0000 1100 011e 9012 22c8 1300 00fc
0275000  9212 6158 d407 a044 1700 00fc 9612 e188 4000 89af 0100 0000 d007 a044 1080 0003 0100 0000 9010 2000 b010 0008 81c7 e008
0275060  81e8 0000 0000 0000 033f ffff 8200 63a0 9de3 8001 f027 a044 d007 a044 d002 0000 4000 53ff 0100 0000 d007 a044 4000 53fc
0275140  0100 0000 81c7 e008 81e8 0000 033f ffff 8200 6398 9de3 8001 f027 a044 9010 2008 4000 53d8 0100 0000 d027 bffc d007 bffc
0275220  d207 a044 d402 6004 d422 2004 d607 a044 d002 e004 9002 2001 4000 53ce 0100 0000 d807 bffc d023 0000 da07 a044 de03 4000
0275300  ba10 000f e007 bffc e204 0000 b810 0011 c027 bff8 e407 a044 e604 a004 e807 bff8 80a5 0013 1680 000b 0100 0000 d04f 4000
0275360  102f 0000 ba07 6001 b807 2001 d607 bff8 9602 e001 d627 bff8 10bf fff3 0100 0000 d807 a044 da03 2004 de07 bffc e003 c000
0275440  c02c 000d d007 bffc 1080 0003 0100 0000 9010 2000 b010 0008 81c7 e008 81e8 0000 033f ffff 8200 63a0 9de3 8001 f027 a044
0275520  d007 a044 4000 53be 0100 0000 81c7 e008 81e8 0000 033f ffff 8200 6398 9de3 8001 f027 a044 9010 2008 4000 539a 0100 0000
0275600  d027 bffc d007 bffc d207 a044 d402 6004 d422 2004 d607 bffc d807 a044 da03 0000 da22 c000 d007 bffc 1080 0003 0100 0000
0275660  9010 2000 b010 0008 81c7 e008 81e8 0000 033f ffff 8200 63c0 9de3 8001 f027 a044 f227 a048 d007 a048 d202 2004 d407 a044
0275740  d602 a004 80a2 c009 1280 0023 0100 0000 d007 a044 d202 0000 ba10 0009 d407 a048 d602 8000 b810 000b b610 2000 d807 a044
0276020  da03 2004 80a6 c00d 1680 0014 0100 0000 9007 0000 b807 2001 d24a 0000 9407 4000 ba07 6001 d64a 8000 80a2 c009 0280 0008
0276100  0100 0000 d04f 0000 9210 0008 d04f 4000 9022 0009 1080 0010 0100 0000 b606 e001 10bf ffeb 0100 0000 9010 2000 1080 000a
0276160  0100 0000 d007 a048 d202 2004 d407 a044 d002 a004 9022 0009 1080 0003 0100 0000 9010 2000 b010 0008 81c7 e008 81e8 0000
0276240  033f ffff 8200 63c0 9de3 8001 f027 a044 1100 0007 9012 21e5 b610 0008 d007 a044 d202 2004 b810 0009 d407 a044 d602 8000
0276320  ba10 000b 9807 0000 b827 2001 8090 000c 0480 000c 0100 0000 d04f 4000 9210 0008 b61e c009 ba07 6001 972e e008 b61e c00b
0276400  993e e005 b61e c00c 10bf fff3 0100 0000 9b3e e01d b61e c00d 9f2e e017 b61e c00f a13e e013 b61e c010 a32e e011 b61e c011
0276460  a53e e00d b61e c012 a72e e00b b61e c013 a93e e007 b61e c014 ab2e e005 b61e c015 ad3e e003 b61e c016 af2e e001 b61e c017
0276540  9010 001b 1080 0003 0100 0000 9010 2000 b010 0008 81c7 e008 81e8 0000 033f ffff 8200 63a0 9de3 8001 f027 a044 f227 a048
0276620  f427 a04c d007 a044 1300 00fc 9212 620c 9410 2001 d607 a048 d807 a04c 4000 0006 0100 0000 9010 2000 b010 0008 81c7 e008
0276700  81e8 0000 033f ffff 8200 63a0 9de3 8001 f027 a044 f227 a048 f427 a04c f627 a050 f827 a054 d007 a050 4000 518e 0100 0000
```

```
0276760  d007 a054 8090 0008 0280 0011 0100 0000 1100 0067 9012 20a0 1300 0066 9212 63c0 1500 0066 9412 a26c 1700 0066 9612 e238
0277040  9810 2001 4000 594b 010c 0000 d207 a044 d022 4000 1080 000f 0100 0000 1100 0067 9012 20a0 1300 0066 9212 63c0 1500 0066
0277120  9412 a364 1700 0066 9612 e340 9810 2001 4000 593c 0100 0000 d207 a044 d022 4000 4000 5188 0100 0000 9010 2000 b010 0008
0277200  81c7 e008 81e8 0000 033f ffff 8200 63a0 9de3 8001 f027 a044 f227 a048 d007 a048 8090 0008 1280 0007 0100 0000 d007 a044
0277260  4000 88a2 0100 0000 1080 0006 0100 0000 d007 a048 1080 0003 0100 0000 9010 2000 b010 0008 81c7 e008 81e8 0000 033f ffff
0277340  8200 6398 9de3 8001 f027 a044 f227 a048 f427 a04c f627 a050 d007 a04c d207 a050 7fff ffe2 0100 0000 d027 bffc d007 a04c
0277420  d027 bff8 9227 a008 d007 a048 d407 a044 4000 5a20 0100 0000 1080 0003 0100 0000 9010 2000 b010 0008 81c7 e008 81e8 0000
0277500  033f ffff 9200 6398 9de3 8001 f027 a044 f227 a048 f427 a04c f627 a050 d007 a04c d207 a050 7fff ffc9 0100 0000 d027 bffc
0277560  d007 a04c d027 bff8 9227 a008 d007 a048 4000 5976 0100 0000 8090 0008 0280 000b 0100 0000 9227 a008 d007 a048 4000 59b8
0277640  0100 0000 d207 a044 d022 4000 9010 2001 1080 0008 0100 0000 d007 a044 c022 0000 9010 2000 1080 0003 0100 0000 9010 2000
0277720  b010 0008 81c7 e008 81e8 0000 033f ffff 8200 6398 9de3 8001 f027 a044 f227 a048 f427 a04c d007 a048 d207 a04c 7fff ffa3
0300000  0100 0000 d027 bffc d007 a048 d027 bff8 9227 a008 d007 a044 4000 5950 0100 0000 8090 0008 0280 0009 0100 0000 9227 a008
0300060  d007 a044 4000 5aa2 0100 0000 9010 2001 1080 0006 0100 0000 9010 2000 1080 0003 0100 0000 9010 2000 b010 0008 81c7 e008
0300140  81e8 0000 033f ffff 8200 6390 9de3 8001 f027 a044 f227 a048 c027 bff4 9427 a004 9627 a008 d207 bff4 d007 a044 4000 5b5e
0300220  0100 0000 d027 bff4 8090 0008 0280 000c 0100 0000 c207 a048 d007 bffc d402 2004 d207 bffc d202 4000 d007 bff8 9fc0 4000
0300300  0100 0000 10bf ffee 0100 0000 9010 2000 b010 0008 81c7 e008 81e8 0000 033f ffff 8200 63c0 9de3 8001 f027 a044 9010 2000
0300360  b010 0008 81c7 e008 81e8 0000 033f ffff 8200 63a0 9de3 8001 f027 a044 f227 a048 f427 a04c d007 a044 1300 00fc 9212 620c
0300440  9410 2001 d607 a048 d807 a04c 4000 0006 0100 0000 9010 2000 b010 0008 81c7 e008 81e8 0000 033f ffff 8200 63a0 9de3 8001
0300520  f027 a044 f227 a048 f427 a04c f627 a050 f827 a054 d007 a044 d207 a048 d407 a04c d607 a050 d807 a054 7fff ff13 0100 0000
0300600  9010 2000 b010 0008 81c7 e008 81e8 0000 033f ffff 8200 63a0 9de3 8001 f027 a044 f227 a048 f427 a04c f627 a050 d007 a044
0300660  d207 a048 d407 a04c d607 a050 7fff ff48 0100 0000 1080 0003 0100 0000 9010 2000 b010 0008 81c7 e008 81e8 0000 033f ffff
0300740  8200 63a0 9de3 8001 f027 a044 f227 a048 f427 a04c f627 a050 d007 a044 d207 a048 d407 a04c d607 a050 7fff ff4e 0100 0000
0301020  1080 0003 0100 0000 9010 2000 b010 0008 81c7 e008 81e8 0000 033f ffff 8200 63a0 9de3 8001 f027 a044 f227 a048 f427 a04c
0301100  d007 a044 d207 a048 d407 a04c 7fff ff64 0100 0000 1080 0003 0100 0000 9010 2000 b010 0008 81c7 e008 81e8 0000 033f ffff
0301160  8200 63a0 9de3 8001 f027 a044 f227 a048 d007 a044 d207 a048 7fff ff77 0100 0000 9010 2000 b010 0008 81c7 e008 81e8 0000
0301240  033f ffff 8200 63a0 9de3 8001 f027 a044 d007 a044 7fff ff8a 0100 0000 9010 2000 b010 0008 81c7 e008 81e8 0000 033f ffff
0301320  8200 63a0 9de3 8001 f027 a044 f227 a048 d007 a044 1300 00fc 9212 620c 9410 2001 d607 a048 4000 0006 0100 0000 9010 2000
0301400  b010 0008 81c7 e008 81e8 0000 033f ffff 8200 63a0 9de3 8001 f027 a044 f227 a048 f427 a04c f627 a050 d007 a050 4000 503d
0301460  0100 0000 9010 2001 4000 5833 0100 0000 d207 a044 d022 4000 4000 5052 0100 0000 9010 2000 b010 0008 81c7 e008 81e8 0000
0301540  033f ffff 8200 63a0 9de3 8001 f027 a044 f227 a048 f427 a04c d007 a048 d207 a04c d407 a044 4000 5907 0100 0000 1080 0003
0301620  0100 0000 9010 2000 b010 0008 81c7 e008 81e8 0000 033f ffff 8200 63a0 9de3 8001 f027 a044 f227 a048 f427 a04c d007 a048
0301700  d207 a04c 4000 5865 0100 0000 8090 0008 0280 000b 0100 0000 d007 a048 d207 a04c 4000 58a7 0100 0000 d207 a044 d022 4000
0301760  9010 2001 1080 0008 0100 0000 d007 a044 c022 0000 9010 2000 1080 0003 0100 0000 9010 2000 b010 0008 81c7 e008 81e8 0000
0302040  033f ffff 8200 63a0 9de3 8001 f027 a044 f227 a048 d007 a044 d207 a048 4000 5847 0100 0000 8090 0008 0280 0009 0100 0000
0302120  d007 a044 d207 a048 4000 5999 0100 0000 9010 2001 1080 0006 0100 0000 9010 2000 1080 0003 0100 0000 9010 2000 b010 0008
0302200  81c7 e008 81e8 0000 033f ffff 8200 6390 9de3 8001 f027 a044 f227 a048 c027 bff4 9427 a004 9627 a008 d207 bff4 d007 a044
0302260  4000 5a55 0100 0000 d027 bff4 809c 0008 0280 0009 0100 0000 c207 a048 d007 bff8 d207 bffc 9fc0 4000 0100 0000 10bf fff1
0302340  0100 0000 81c7 e008 81e8 0000 033f ffff 8200 63a0 9de3 8001 f027 a044 d007 a044 7fff fef7 0100 0000 81c7 e008 81e8 0000
0302420  033f ffff 9200 6398 9de3 8001 f027 a044 f227 a048 1100 0129 d002 20e8 9002 2001 1300 0129 d022 60e8 1500 00fc d402 a384
0302500  8090 000a 0280 0007 0100 0000 1100 00fc 9012 23e0 d207 a048 4000 18ec 0100 0000 d607 a044 d802 e00c d827 bffc d207 a048
0302560  932a 6009 d007 bffc 9410 2000 4000 8743 0100 0000 8090 0008 0280 0008 0100 0000 d207 a048 932a 6009 1100 00fc 9012 23f2
0302640  4000 17d2 0100 0000 9010 2000 b010 0008 81c7 e008 81e8 0000 033f ffff 8200 6398 9de3 8001 f027 a044 f227 a048 d007 a044
0302720  d202 200c ba10 0009 b810 21ff f607 a048 d007 4000 9022 2001 d027 4000 8090 0008 0680 000a 0100 0000 d207 6004 9202 6001
0303000  d227 6004 9422 6001 d60a 8000 9810 000b 1080 0006 0100 0000 9010 001d 4000 86df 0100 0000 9810 0008 d82e c000 b606 e001
0303060  b827 2001 8090 001c 14bf ffea 0100 0000 de07 4000 9e23 e001 de27 4000 8090 000f 0680 000a 0100 0000 e007 6004 a004 2001
0303140  e027 6004 a224 2001 e40c 4000 a610 0012 1080 0006 0100 0000 9010 001d 4000 86c7 0100 0000 a610 0008 e627 bffc e807 bffc
0303220  80a5 3fff 1280 0006 0100 0000 1100 00fd 9012 2012 4000 1791 0100 0000 ea07 bffc ea2e c000 9010 2000 b010 0008 81c7 e008
0303300  81e8 0000 033f ffff 8200 63a0 9de3 8001 f027 a044 f227 a048 d007 a048 8090 0008 0480 0043 0100 0000 d207 a044 d402 4000
0303360  9422 a001 d422 4000 8090 000a 0680 000c 0100 0000 d607 a044 d802 e004 9803 2001 d822 e004 9a23 2001 9e10 2078 de2b 4000
0303440  a010 000f 1080 002d 0100 0000 e207 a044 e454 6010 a610 0012 808c e080 0280 0022 0100 0000 e807 a044 ea05 200c ec07 a044
0303520  ee05 8000 b020 0017 80a6 0015 1680 001a 0100 0000 f207 a044 f406 6004 a010 2078 e02e 8000 80a4 200a 0280 000a 0100 0000
0303600  f607 a044 f806 e004 b807 2001 f826 e004 ba27 2001 e00f 4000 1080 0009 0100 0000 d007 a044 d202 2004 d00a 4000 d207 a044
0303660  4000 867d 0100 0000 a010 0008 1080 0007 0100 0000 9010 2078 d207 a044 4000 8676 0100 0000 a010 0008 d407 a048 9422 a001
0303740  d427 a048 10bf ffbd 0100 0000 9010 2000 b010 0008 81c7 e008 81e8 0000 033f ffff 8200 63a0 9de3 8001 f027 a044 f227 a048
0304020  f427 a04c 1100 00fd 9012 2030 1300 00fc d022 63d8 d407 a044 d602 a00c ba10 000b d807 a044 da03 2054 de07 a048 80a3 400f
```

```
0304100  1490 000c 0100 0000 d007 a044 d207 a048 7fff ff30 0100 0000 d007 a044 d207 a048 9402 6001 d422 2054 1080 0006 0100 0000
0304160  d007 a044 d207 a048 7fff ff26 0100 0000 b810 21ff f607 a04c d007 4000 9022 2001 d027 4000 8090 0008 0680 000e 0100 0000
0304240  d207 6004 9202 6001 d227 6004 9422 6001 9606 c000 b606 e001 d84a c000 9a0b 20ff da2a 8000 9e10 000d 1080 002d 0100 0000
0304320  e057 6010 a210 0010 808c 6080 0280 0020 0100 0000 e407 4000 a620 0012 e807 600c 80a4 c014 1680 001a 0100 0009 aa06 c000
0304400  b606 e001 de4d 4000 9e0b e0ff ec07 6004 de21 8000 80a3 e00a 0280 0009 0100 0000 ee07 6004 ae05 e001 ee27 6004 b025 e001
0304460  de0e c000 1080 0008 0100 0000 f207 6004 100e 4000 9210 001d 4000 8617 0100 0000 9e10 0008 1080 000a 0100 0000 b406 c000
0304540  b606 e001 104e 8000 900a 20ff 9210 001d 4030 860d 0100 0000 9e10 0008 b827 2001 8090 001c 14bf ffc1 0100 0000 d007 4000
0304620  9022 2001 d027 4000 8090 0008 0680 000c 0100 0000 d207 6004 9202 6001 d227 6004 9422 6001 d64e c000 980a e0ff d82a 8000
0304700  9a10 000c 1080 0029 0100 0000 de57 6010 a010 000f 808c 2080 0280 001e 0100 0000 e207 4000 a420 0011 e607 600c 80a4 8013
0304760  1680 0018 0100 0000 e807 6004 da4e c000 9a0b 60ff da2d 0000 80a3 600a 0280 0009 0100 0000 ea07 6004 aa05 6001 ea27 6004
0305040  ac25 6001 da0d 8000 1080 0008 0100 0000 ee07 6004 d00d c000 9210 001d 4000 85da 0100 0000 9a10 0008 1080 0008 0100 0000
0305120  104e c000 900a 20ff 9210 001d 4000 85d2 0100 0000 9a10 0008 80a3 7fff 1280 000b 0100 0000 f04e c000 b210 0018 80a6 7fff
0305200  0280 0006 0100 0000 1100 00fd 9012 203d 4000 1696 0100 0000 f407 a044 9010 2001 d02e a078 1300 00fc c022 63d8 9010 2000
0305260  b010 0008 81c7 e008 81e8 0000 033f ffff 8200 63c0 9de3 8001 f027 a044 f427 a04c d007 a044 d24a 2018 9410 0009 80a2 bfff
0305340  1280 0004 0100 0000 1080 002c 0100 0000 d607 a044 d94a e01a 9a10 000c de07 a044 e04b e01b a210 0010 a424 400d e607 a044
0305420  e84c e019 aa10 0014 ac1c 8015 ae0d a0f7 b015 e041 b810 0018 f407 a04c 8090 001a 0280 0004 0100 0000 b620 001c b810 001b
0305500  9010 001c 912a 2002 9210 0008 932a 6007 9020 0008 9002 0009 ba10 0008 8090 001d 0280 000d 0100 0000 952f 6018 953a a018
0305560  d64e 4000 9602 c00a 972a e018 973a e018 d62e 4000 b206 6001 ba27 401c 10bf fff4 0100 0000 9010 2000 b010 0008 81c7 e008
0305640  81e8 0000 033f ffff 8200 63a0 9de3 8001 b226 6001 d006 8000 9022 2001 d026 8000 8090 0008 0680 000e 0100 0000 d206 a004
0305720  9202 6001 d226 a004 9422 6001 9606 0000 b006 2001 d84a c000 9a0b 20ff da2a 8000 9e10 000d 1080 002d 0100 0000 e056 a010
0306000  a210 0010 808c 6080 0280 0020 0100 0000 e406 8000 a620 0012 e806 a00c 80a4 c014 1680 001a 0100 0000 aa06 0000 b006 2001
0306060  de4d 4000 9e0b e0ff ec06 a004 de2d 8000 80a3 e00a 0280 0009 0100 0000 ee06 a004 ae05 e001 ee26 a004 b625 e001 de0e c000
0306140  1080 0008 0100 0000 f806 a004 d00f 0000 9210 001a 4000 854c 0100 0000 9e10 0008 1080 000a 0100 0000 ba06 0000 b006 2001
0306220  d04f 4000 900a 20ff 9210 001a 4000 8542 0100 0000 9e10 0008 b226 6001 8090 0019 14bf ffc1 0100 0000 d006 8000 9022 2001
0306300  d026 8000 8090 0008 0680 000c 0100 0000 d206 a004 9202 6001 d226 a004 9422 6001 d64e 0000 980a e0ff d82a 8000 9a10 000c
0306360  1080 0029 0100 0000 de56 a010 a010 000f 808c 2080 0280 001e 0100 0000 e206 8000 a420 0011 e606 a00c 80a4 8013 1680 0018
0306440  0100 0000 e806 a004 da4e 0000 9a0b 60ff da2d 0000 60a3 600a 0280 0009 0100 0000 ea06 a004 aa05 6001 ea26 a004 ac25 6001
0306520  da0d 8000 1080 0008 0100 0000 ee06 a004 d00d c000 9210 001a 4000 850f 0100 0000 9a10 0008 1080 0008 0100 0000 d04e 0000
0306600  900a 20ff 9210 001a 4000 8507 0100 0000 9a10 0008 80a3 7fff 1280 000b 0100 0000 f64e 0000 b810 001b 80a7 3fff 0280 0006
0306660  0100 0000 1100 00fd 9012 2076 4000 15cb 0100 0000 9010 2000 b010 0008 81c7 e008 81e8 0000 033f ffff 8200 6388 9de3 8001
0306740  f027 a044 d007 a044 d24a 2003 9410 0009 80a2 a020 1280 000e 0100 0000 d607 a044 d84a e006 9a10 000c 80a3 6020 1280 0008
0307020  0100 0000 de07 a044 e04b e008 a210 0010 80a4 6020 0280 0005 0100 0000 9010 2001 1080 0059 0100 0000 e407 a044 c02c a003
0307100  d007 a044 1300 00fd 9212 60af 4000 84b5 0100 0000 8090 0008 0280 0005 0100 0000 9010 2001 1080 004c 0100 0000 e607 a044
0307160  a810 2020 e82c e003 ea07 a044 c02d 6006 d007 a044 9002 2004 4000 84af 0100 0000 d027 bffc ec07 a044 ae10 2020 ee2d a006
0307240  f007 bffc 3300 00fc f206 63bc 80a6 0019 0280 000f 0100 0000 d007 bffc 1300 00fc d202 63bc 80a2 0009 0480 0006 0100 0000
0307320  1100 00fd 9012 20b3 4000 1584 0100 0000 9010 2001 1080 002c 0100 0000 d407 a044 d64a a007 9810 000b 80a3 2057 0280 0005
0307400  0100 0000 9010 2001 1080 0023 0100 0000 1b00 00fc da03 638c 8090 000d 0280 0005 0100 0000 9010 2000 1080 001b 0100 0000
0307460  9027 a014 1300 00fd 9212 60e0 4000 8467 0100 0000 9027 a014 1300 00fd 9212 60e5 4000 8480 0100 0000 d007 a044 9002 2009
0307540  9227 a014 4000 846f 0100 0000 8090 0008 0280 0005 0100 0000 9010 2001 1080 0006 0100 0000 9010 2000 1080 0003 0100 0000
0307620  9010 2000 b010 0008 81c7 e008 81e8 0000 033f ffff 8200 63a0 9de3 8001 f027 a044 d007 a044 1300 00fd 9212 60e7 4000 8447
0307700  0100 0000 1100 00fc d002 23bc 9210 200a 4000 8487 0100 0000 9002 2030 d207 a044 d02a 6004 1100 00fc d002 23bc 9210 200a
0307760  4000 8482 0100 0000 9402 2030 d607 a044 d42a e005 d807 a044 9a10 2057 da2b 2007 d007 a044 1300 00fd 9212 60f1 4000 844d
0310040  0100 0000 d007 a044 1300 00fd 9212 60f6 4000 8448 0100 0000 9010 2000 b010 0008 81c7 e008 81e8 0000 033f ffff 8200 6398
0310120  9de3 8001 f027 a044 d007 a044 d027 bffc d207 a044 d407 bffc d602 a02c d622 6030 d807 a044 da07 bffc de03 6028 de23 202c
0310200  e007 a044 e207 bffc e454 6026 a610 0012 e624 2028 e807 a044 ea07 bffc ec55 6024 ae10 0016 ee25 2024 f007 a044 f207 bffc
0310260  f406 6020 f426 2020 f607 a044 f807 bffc fa07 201c fa26 e01c d007 a044 d207 bffc d402 6018 d422 2018 d607 a044 d807 bffc
0310340  da03 2014 da22 e014 de07 a044 e007 bffc e24c 2010 e22b e010 d007 a044 7fff ffa9 0100 0000 9010 2000 b010 0008 81c7 e008
0310420  81e8 0000 033f ffff 8200 6388 9de3 8001 f027 a044 d007 a044 d202 200c d227 bffc d007 a044 9210 2000 7fff fcf6 0100 0000
0310500  d407 a044 9602 a010 d627 bff8 d807 bff8 d827 bff4 da07 bffc de03 4000 9e23 e001 de23 4000 8090 000f 0680 000b 0100 0000
0310560  e007 bffc e204 2004 a204 6001 e224 2004 a424 6001 e60c 8000 a810 0013 1080 0006 0100 0000 d007 bffc 4000 8400 0100 0000
0310640  a810 0008 e827 bfec ea07 bfec 80a5 7fff 1280 0005 0100 0000 9010 2002 1080 00a8 0100 0000 ec07 bff4 ee07 bfec ee2d 8000
0310720  f007 bff4 b006 2001 f027 bff4 b210 2033 f227 bff0 f407 bff0 8090 001a 0480 0029 0100 0000 d007 bffc d202 0000 9222 6001
0311000  d222 0000 8090 0009 0680 000b 0100 0000 d407 bffc d602 a004 9602 e001 d622 a004 9822 e001 da0b 0000 9e10 0004 1080 0006
0311060  0100 0000 d007 bffc 4000 83d8 0100 0000 9e10 0008 de27 bfec e007 bfec 80a4 3fff 1280 0005 0100 0000 9010 3fff 1080 0080
0311140  0100 0000 e207 bff4 e407 bfec e42c 4000 e607 bff4 a604 e001 e627 bff4 e807 bff0 a825 2001 e827 bff0 10bf ffd7 0100 0000
```

```
0311220  d007 bff8 1300 00fc 9212 63ac 4000 83a1 0100 0000 8090 0008 1280 0005 0100 0000 d007 bffa 7fff ff65 0100 0000 d007 bff8
0311300  7fff fec5 0100 0000 8090 0008 0280 0005 0100 0000 9010 3fff 1080 0061 0100 0000 ea07 bff8 ec4d 6010 ae10 0016 80a5 e031
0311360  1280 000c 0100 0000 f007 bff8 f206 202c 80a6 7fff 1280 0007 0100 0000 f407 bff8 f606 a030 80a6 ffff 0280 0005 0100 000c
0311440  9010 3fff 1080 004e 0100 0000 f807 bff8 fa07 2028 808f 7ffe 0280 0005 0100 0000 9010 3fff 1080 0046 0100 0000 d007 bff8
0311520  d202 2014 80a2 6002 1680 0005 0100 0000 9010 3fff 1080 003e 0100 0000 d407 bff8 d602 a014 d807 bff8 da03 2018 80a3 400b
0311600  0680 0005 0100 0000 9010 3fff 1080 0034 0100 0000 de07 bff8 e003 e020 8090 0010 1680 0005 0100 0000 9010 3fff 1080 002c
0311660  0100 0000 e207 bff8 e404 601c 80a4 a001 0680 0009 0100 0000 e607 bff8 e804 e014 ea07 bff8 ec05 601c 80a5 8014 0680 0005
0311740  0100 0000 9010 3fff 1080 001d 0100 0000 ee07 bff8 d005 e024 9210 21fc 4000 837f 0100 0000 8090 0008 0280 0005 0100 0000
0312020  9010 3fff 1080 0012 0100 0000 f007 bff8 f206 2014 b426 6001 f607 bff8 f806 e024 bb2f 2003 80a7 401a 1680 0005 0100 0000
0312100  9010 3fff 1080 0006 0100 0000 9010 2000 1080 0003 0100 0000 9010 2000 b010 0008 81c7 e008 81e8 0000 033f ffff 8200 6398
0312160  9de3 8001 f027 a044 1100 00fd 9012 20f8 1300 00fc d022 63d8 d407 a044 9602 a010 d627 bffc d807 bffc 9a10 2001 da23 2014
0312240  de07 bffc a010 3fff e023 e018 e207 bffc c024 6020 e407 bffc a610 3fff e624 a01c e807 bffc c025 2024 ea07 bffc ac10 2031
0312320  ec2d 6010 ee07 bffc b010 200d f02d e011 f207 bffc b410 205a f42e 6012 f607 bffc b810 2001 f826 e028 fa07 bffc d007 bffc
0312400  9210 3fff d222 2030 d227 602c d007 bffc 1300 00fd 9212 6106 4000 82f0 0100 0000 d007 a044 9210 2000 7fff fbfa 0100 0000
0312460  d407 a044 d402 a00c 9210 2034 d007 bffc 7fff fd99 0100 0000 d607 a044 d002 e00c 9210 21cc 7fff fc5c 0100 0000 d007 bffc
0312540  7fff fe90 0100 0000 1900 00fc c023 2318 9010 2000 b010 0008 81c7 e008 81e8 0000 033f ffff 8200 6388 9de3 8001 f027 a044
0312620  d007 a044 d202 2068 9402 6007 8090 000a 1680 0003 0100 0000 9402 a007 953a a003 d427 bff0 d807 a044 da03 206c 8090 000d
0312700  1680 0003 0100 0000 9a03 6007 9b3b 6003 da27 bff4 e007 bff4 e207 bff0 80a4 0011 1680 0016 0100 0000 e407 a044 e604 a05c
0312760  e807 bff4 ea4c c014 ac10 0015 ec07 a044 f005 e058 f207 bff4 f44e 0019 b610 001a b816 c016 ba0f 20ff 80a7 60ff 1280 0007
0313040  0100 0000 d007 bff4 9002 2001 d027 bff4 10bf ffe9 0100 0000 d207 a044 d402 6064 d607 bff4 80a2 c00a 1680 0010 0100 0000
0313120  d807 a044 da03 205c de07 bff4 e04b 400f a210 0010 a40c 60ff 80a4 a0ff 1280 0007 0100 0000 e607 bff4 a604 e001 e627 bff4
0313200  10bf ffee 0100 0000 e807 a044 ea05 2064 ec07 bff4 80a5 0015 0680 0005 0100 0000 d007 a044 4000 00fb 0100 0000 ee07 bff4
0313260  f007 bff0 80a5 c018 1680 0010 0100 0000 f207 a044 f406 605c f607 bff4 f84e 801b ba10 001c d007 a044 d202 2058 d407 bff4
0313340  d64a 400a 9810 000b 9a13 001d da2f bfff 1080 0007 0100 0000 de07 a044 e003 e05c e207 bff4 e44c 0011 e42f bfff d04f bfff
0313420  4000 00bc 0100 0000 d027 bff8 e607 a044 e804 e05c ea07 bff4 ec07 bff8 2f00 00fc ae15 e3c0 f04d 8017 f24d 0015 b216 4018
0313500  b32e 6018 b33e 6018 f22d 0015 f407 bff4 b72e a003 f807 bff8 ba06 c01c 9007 6001 d027 bfec d207 a044 d407 bfec d422 606c
0313560  d607 a044 d802 e050 da07 bfec 80a3 000d 1480 0006 0100 0000 de07 a044 e003 e050 a004 2001 e023 e050 2300 0129 e204 60e8
0313640  a204 6001 2500 0129 e224 a0e8 2700 00fc e604 e384 8090 0013 0280 0007 0100 0000 1100 00fd 9012 2113 d207 bfec 4000 144f
0313720  0100 0000 e807 bfec 8090 0014 1480 0007 0100 0000 1100 00fd 9012 2124 d207 bfec 4000 133e 0100 0000 2b00 0129 ea05 60d8
0314000  8090 0015 0280 0010 0100 0000 ec07 a044 d205 a060 9010 2001 d407 bfec 7fff fad1 0100 0000 8090 0008 1280 0007 0100 0000
0314060  1100 00fd 9012 2146 d207 bfec 4000 132b 0100 0000 d007 bfec 1080 0003 0100 0000 9010 2000 b010 0008 81c7 e008 81e8 0000
0314140  033f ffff 8200 6398 9de3 8001 f027 a044 f227 a048 1100 0129 d002 20e8 9002 2001 1300 0129 d022 60e8 1500 00fc d402 a384
0314220  8090 000a 0280 0007 0100 0000 1100 00fd 9012 2161 d207 a048 4000 1418 0100 0000 d607 a048 9622 e001 d627 a048 d807 a048
0314300  8090 000c 1680 0003 0100 0000 9803 2007 993b 2003 d827 bff8 de07 a044 e003 e064 a210 0010 e407 bff8 a610 0012 80a4 c011
0314360  0a80 0007 0100 0000 1100 00fd 9012 2174 d207 a048 4000 12f9 0100 0000 e807 a048 aa10 2007 8090 0014 1680 0007 0100 0000
0314440  a820 0014 a80d 4014 a820 0014 1080 0003 0100 0000 a80d 0015 e827 bffc ec07 bffc 2f00 00fc ae15 e3c0 f04d 8017 b210 0018
0314520  b41e 7fff b72e a018 b73e e018 f807 a044 fa07 205c d007 bff8 d24f 4008 920a 401b 932a 6018 933a 6018 d22f 4008 d407 a044
0314600  d602 a06c d807 a048 80a3 000b 1680 0019 0100 0000 d007 a044 d202 2068 d407 a048 80a2 8009 1680 0010 0100 0000 d607 bffc
0314660  1900 00fc 9813 23c0 da4a c00c 9e10 000d e007 a044 e204 2058 e407 bff8 e64c 4012 a810 0013 aa0d 000f 808d 60ff 1280 0005
0314740  0100 0000 ec07 a044 ee07 a048 ee25 a06c 9010 2000 b010 0008 81c7 e008 81e8 0000 033f ffff 8200 6398 9de3 8001 f02f a047
0315020  c027 bffc d007 bffc 1300 00fc 9212 63c0 d44a 0009 9610 000a d84f a047 9a10 000c 9e0b 400b 808b e0ff 0280 000f 0100 0000
0315100  d007 bffc 9002 2001 d027 bffc d207 bffc 90a2 6008 0680 0006 0100 0000 1100 00fd 9012 2199 4000 12a1 0100 0000 10bf ffea
0315160  0100 0000 d007 bffc 1080 0003 0100 0000 9010 2000 b010 0008 81c7 e008 81e8 0000 033f ffff 8200 6390 9de3 8001 f027 a044
0315240  1100 0129 d002 20e8 9002 2001 1300 0129 d022 60e8 1500 00fc d402 a384 8090 000a 0280 0006 0100 0000 1100 00fd 9012 21b6
0315320  4000 138e 0100 0000 d607 a044 d802 e064 d827 bff4 d007 bff4 9002 21fc 9210 21fc 4000 81bf 0100 0000 912a 2002 9a10 0008
0315400  9b2b 6007 9020 0008 9002 000d d027 bff0 de07 a044 d203 e008 d007 bff0 4000 2afd 0100 0000 d027 bff8 e007 a044 e204 205c
0315460  e227 bffc e407 a044 e607 bff8 e624 a05c e807 a044 ea07 bff0 ea25 2064 ec07 bff4 ee07 bff0 ae25 c016 ee27 bff0 f007 bff4
0315540  8090 0018 0480 0011 0100 0000 f207 bff8 f407 bffc f64e 8000 f62e 4000 f807 bffc b807 2001 f827 bffc fa07 bff8 ba07 6001
0315620  fa27 bff8 d007 bff4 9022 2001 d027 bff4 10bf ffef 0100 0000 d207 bff0 8090 0009 0480 000c 0100 0000 d407 bff8 c02a 8000
0315700  d607 bff8 9602 e001 d627 bff8 d807 bff0 9823 2001 d827 bff0 10bf fff4 0100 0000 9010 2000 b010 0008 81c7 e008 81e8 0000
0315760  033f ffff 8200 63a0 9de3 8001 f027 a044 d007 a044 1300 00fd 9212 61c8 4000 8145 0100 0000 8090 0008 0280 000a 0100 0000
0316040  d007 a044 1300 00fd 9212 61cb 4000 813d 0100 0000 8090 0008 1280 001a 0100 0000 d007 a044 1300 00fd 9212 61cd 4000 8135
0316120  0100 0000 8090 0008 0280 000a 0100 0000 d007 a044 1300 00fd 9212 61d0 4000 812d 0100 0000 8090 0008 1280 0006 0100 0000
0316200  1100 00fd 9012 21d3 1080 0004 0100 0000 1100 00fd 9012 21d6 1080 0033 0100 0000 d007 a044 1300 00fd 9212 61d9 4000 811d
0316260  0100 0000 8090 0008 0280 000a 0100 0000 d007 a044 1300 00fd 9212 61dc 4000 8115 0100 0000 8090 0008 1280 001a 0100 0000
```

```
0316340  d007 a044 1300 00fd 9212 61de 4000 810d 0100 0000 8090 0008 0280 000a 0100 0000 d007 a044 1300 00fd 9212 61e1 4000 8105
0316420  0100 0000 8090 0008 1280 0006 0100 0000 1100 00fd 9012 21e4 1080 0004 0100 0000 1100 00fd 9012 21e7 1080 000b 0100 0000
0316500  1100 00fd 9012 21ea d207 a044 4000 11e7 0100 0000 9010 2000 1080 0003 0100 0000 9010 2000 b010 0008 81c7 e008 81e8 0000
0316560  033f ffff 8200 6390 9de3 8001 f027 a044 f227 a048 d007 a044 d202 0000 d227 bffc d407 bffc 1700 00fc d422 e3dc d807 a048
0316640  da4b C000 da2f bff7 de4f bff7 a010 000f d0a4 206d 1280 0005 0100 0000 e207 a048 a410 2077 e42c 4000 e607 a348 e84c e001
0316720  aa10 C014 80a5 6066 1280 0036 0100 0000 d007 a049 d24a 0000 9410 0009 80a2 a072 1280 0017 0100 0000 9010 2000 d207 bffc
0317000  4000 24d0 0100 0000 d027 bff8 1100 0129 d002 20e8 9002 2001 1300 0129 d022 60e8 1500 00fc d402 a384 8090 000a 0280 0006
0317060  0100 0000 1100 00fd 9012 2210 4000 12b3 0100 0000 1080 0015 0100 0000 9010 2000 d207 bffc 4000 2499 0100 0000 d027 bff8
0317140  1100 0129 d002 20e8 9002 2001 1300 0129 d022 60e8 1500 00fc d402 a384 8090 000a 0280 0006 0100 0000 1100 00fd 9012 2222
0317220  4000 129e 0100 0000 d007 bff8 4000 24f9 0100 0000 d027 bffc 1080 001c 0100 0000 1100 0129 d002 20e8 9002 2001 1300 0129
0317300  d022 60e8 1500 00fc d402 a384 8090 000a 0280 000a 0100 0000 d007 a048 7fff ff45 0100 0000 9210 0008 1100 00fd 9012 2235
0317360  4000 1286 0100 0000 d007 a048 7fff ff3d 0100 0000 9210 0008 d007 bffc 4000 8067 0100 0000 d027 bff8 d607 a048 d84f bff7
0317440  d82a c000 da07 a044 de07 bffc de23 4000 2100 00fc c024 23dc d007 bff8 1080 0003 0100 0000 9010 2000 b010 0008 81c7 e008
0317520  81e8 0000 033f ffff 8200 6398 9de3 8001 f027 a044 f227 a048 f42f a04f 9010 2400 4000 2994 0100 0000 d027 bff8 9010 207c
0317600  d207 bff8 4000 29e3 0100 0000 d027 bffc d007 bffc d207 bff8 d222 2008 d407 bffc d607 a044 d622 a00c d007 a048 4000 8063
0317660  0100 0000 9002 2001 d207 bff8 4000 29d5 0100 0000 d807 bffc d023 2004 da07 bffc d003 6004 d207 a048 4000 8040 0100 0000
0317740  de07 bffc e04f a04f a210 0010 80a4 6072 0280 0005 0100 0000 a410 2001 1080 0003 0100 0000 a410 2000 e42b e079 e607 bffc
0320020  e84f a04f aa10 0014 80a5 606d 1280 0005 0100 0000 ac10 2001 1080 0003 0100 0000 ac10 2000 ec2c e07b ee07 bffc b010 2001
0320100  f035 e074 f207 bffc c02e 6078 f407 bffc b610 2001 f62e a07a f807 bffc c027 204c fa07 bffc c027 6058 d007 bffc c022 205c
0320160  d207 bffc c022 606c d407 bffc c022 a070 d607 bffc c022 e060 1900 0129 d803 20d8 8090 000c 0280 0008 0100 0000 d007 bffc
0320240  9002 2060 1300 0129 d202 60dc 7fff f088 0100 0000 d007 bffc 1080 0003 0100 0000 9010 2000 b010 0008 81c7 e008 81e8 0000
0320320  033f ffff 8200 6388 9de3 8001 f027 a044 f227 a048 f427 a04c f627 a050 d007 a04c 9002 21fb 9210 21fc 4000 803d 0100 0000
0320400  d027 bffc d007 bffc 912a 2002 9210 0008 932a 6007 9020 0008 9002 0009 9402 2004 d427 bff8 d607 a044 d202 e008 d007 bff8
0320460  4000 2978 0100 0000 d027 bfec d807 bfec d827 bfe8 1b3f fff6 9a13 60f0 da27 bff0 de07 bffc 8090 000f 0480 0031 0100 0000
0320540  d007 bfe8 d202 0000 d227 bff4 d407 a048 8090 000a 1680 0006 0100 0000 1100 00fd 9012 224e 4000 10d9 0100 0000 d607 a048
0320620  d807 bff0 80a2 c00c 0280 0006 0100 0000 d007 a044 d207 a048 7fff f8da 0100 0000 d007 a044 d207 bfe8 7fff f900 0100 0000
0320700  da07 a050 de07 a048 de23 4000 e007 a050 a004 2004 e027 a050 e207 a048 a404 6001 e427 bff0 e607 bfe8 e804 c000 e827 a048
0320760  ea07 bfe8 ec07 bff4 ec25 4000 ee07 bfe8 ae05 e1fc ee27 bfe8 f007 bffc b026 2001 f027 bffc 10bf ffcf 0100 0000 f207 a048
0321040  80a6 7fff 0280 0006 0100 0000 1100 00fd 9012 2276 4000 10ad 0100 0000 d007 bfec 9002 2004 1080 0003 0100 0000 9010 2300
0321120  b010 0008 81c7 e008 81e8 0000 033f ffff 8200 6378 9de3 8001 f027 a044 f227 a048 1100 0129 d002 20e8 9002 2001 1300 0129
0321200  d022 60e8 1500 00fc d402 a384 8090 000a 0280 0008 0100 0000 1100 00fd 9012 229e d207 a044 d407 a048 4000 1198 0100 0000
0321260  1700 00fd 9612 e2b4 1900 0128 d623 23f8 1b00 0129 da03 60c8 8090 000d 1280 0004 0100 0000 4000 1250 0100 0000 1f00 0128
0321340  c023 e3fc c027 bff4 a010 2000 e027 bff0 c037 bfe6 e207 a048 e44c 4000 a610 0012 80a4 e072 0280 0005 0100 0000 a810 2001
0321420  1080 0003 0100 0000 a810 2000 e837 bfe4 ea57 bfe4 8090 0015 0280 0008 0100 0000 1100 00fd 9012 22c6 1300 0128 d022 63f8
0321500  1080 0006 0100 0000 1100 00fd 9012 22e7 1300 0128 d022 63f8 d407 a044 d427 bfdc 9027 a024 d207 a048 7fff fe82 0100 0000
0321560  d027 bfd8 d607 bfd8 8090 000b 1280 0013 0100 0000 1100 0129 d002 20e8 9002 2001 1300 0129 d022 60e8 1500 00fc d402 a384
0321640  8090 000a 0280 0006 0100 0000 1100 00fd 9012 2302 4000 1155 0100 0000 9010 2000 1080 015e 0100 0000 1700 00fc d602 e3c8
0321720  d627 bffc d607 bffc 8090 000c 0280 002b 0100 0000 da07 bffc d203 6004 d007 bfdc 4000 7f4c 0100 0000 8090 0008 1280 001e
0322000  0100 0000 d057 bfe4 8090 0008 1280 0013 0100 0000 d207 bffc d44a 6079 8090 000a 1280 000e 0100 0000 d007 bfd8 4000 7f4f
0322060  0100 0000 d007 bffc d252 2074 9202 6001 932a 6010 933a 6010 d232 2074 d007 bffc 1080 013a 0100 0000 d407 bffc 1700 0128
0322140  d422 e3fc 1100 00fd 9012 230f 4000 101f 0100 0000 d807 bffc da03 0000 da27 bffc 10bf ffd5 0100 0000 de07 a048 d44b c000
0322220  d207 bfdc d007 bfd8 7fff feaf 0100 0000 d027 bffc e007 bffc 2300 0128 e024 63fc d007 bffc 7fff fb18 0100 0000 d027 bff8
0322300  e407 bff8 8090 0012 0280 0021 0100 0000 d007 bffc d24a 2079 8090 0009 1280 0017 0100 0000 d007 bffc d002 2008 4000 2855
0322360  0100 0000 1300 0129 d202 60e8 9202 6001 1500 0129 d222 a0e8 1700 00fc d602 e384 8090 000b 0280 0006 0100 0000 1100 00fd
0322440  9012 2331 4000 10f9 0100 0000 9010 2000 1080 0102 0100 0000 d007 bffc 7fff fbcb 0100 0000 9810 2001 d837 bfe6 da07 bffc
0322520  de07 bffc e003 e024 e023 6050 e207 bffc e407 bffc e604 a050 e624 6054 d007 bffc 9002 2044 e807 bffc d205 2008 9410 2000
0322600  7fff f6df 0100 0000 ea07 bffc c025 6048 ec57 bfe6 8090 0016 1280 002a 0100 0000 ee07 bffc f005 e030 8090 0018 0480 0025
0322660  0100 0000 d007 bffc d002 2030 9002 21fb 9210 21fc 4000 7f0a 0100 0000 d027 bff4 d207 bffc d202 6008 d007 bff4 912a 2002
0322740  4000 284c 0100 0000 d027 bfec 1500 00fd 9412 a33e 1700 00fc d422 e3dc d807 bffc d403 2030 da07 bffc d203 6028 d007 bffc
0323020  d607 bfec 7fff feaf 0100 0000 d027 bfe0 1f00 00fc c023 e3dc e007 bffc d404 2030 d207 bfe0 d007 bffc 4000 00c3 0100 0000
0323100  e207 bffc 2500 00fc e404 a3c8 e424 4000 e607 bffc 2900 00fc e625 23c8 ea57 bfe4 8090 0015 1280 0013 0100 0000 1100 0129
0323160  d002 20e8 9002 2001 1300 0129 d022 60e8 1500 00fc d402 a384 8090 000a 0280 0006 0100 0000 1100 00fd 9012 2350 4000 109b
0323240  0100 0000 d007 bffc 1080 00a4 0100 0000 d657 bfe6 8090 000b 0280 0024 0100 0000 d007 bffc c022 2058 d207 bffc c022 6068
0323320  d407 bffc 9610 2001 d62a a079 d807 bffc 9a10 21fc da23 2064 de07 bffc d203 e008 9010 21fc 4000 2907 0100 0000 e007 bffc
0323400  d024 205c a210 21fb e227 bff8 e407 bff8 8090 0012 0630 000b 0100 0000 e607 bffc e804 e05c ea07 bff8 c02d 0015 ec07 bff8
```

```
0323460  ac25 a001 ec27 bff8 10bf fff5 0100 0000 1080 0046 0100 0000 d007 bffc d207 bffc d402 6034 d422 2064 d607 bffc d002 e064
0323540  9002 21fb 9210 21fc 4000 7ea1 0100 0000 d027 bff0 d807 bffc d203 2008 d007 bff0 912a 2002 4000 27e3 0100 0000 d027 bfe8
0323620  1b00 00fd 9a13 6360 1f00 00fc da23 e3dc e007 bffc d404 2064 e207 bffc d204 602c d007 bffc d607 bfe8 7fff fe46 0100 0000
0323700  e407 bffc d024 a058 2700 00fc c024 e3dc e807 bffc ea07 bffc ec05 6050 ae25 a001 ee25 2068 f007 bffc d006 2064 f207 bffc
0323760  d206 6008 4000 27c7 0100 0000 f407 bffc d026 a05c f607 bffc f806 e064 ba27 2001 fa27 bff8 d007 bff8 8090 0008 0680 000f
0324040  0100 0000 d207 bffc d402 605c d607 bff8 d807 bffc da03 2058 de07 bff8 e04b 400f e02a 800b e207 bff8 a224 6001 e227 bff8
0324120  10bf fff1 0100 0000 e407 bff4 e427 bff8 e607 bff8 8090 0013 0480 000f 0100 0000 e807 bfec a805 2004 e827 bfec aa25 2004
0324200  d205 4000 d007 bffc 7fff fbf6 0100 0000 ec07 bff8 ac25 a001 ec27 bff8 10bf fff1 0100 0000 ee07 bff0 ee27 bff8 f007 bff8
0324260  8090 0018 0480 000f 0100 0000 f207 bfe8 b206 6004 f227 bfe8 b426 6004 d206 8000 d007 bffc 7fff fbe3 0100 0000 f607 bff8
0324340  b626 e001 f627 bff8 10bf fff1 0100 0000 3900 0129 f807 20e8 b807 2001 3b00 0129 f827 60e8 1100 00fc d002 2384 8090 0008
0324420  0280 0006 0100 0000 1100 00fd 9012 2370 4000 0ffa 0100 0000 d007 bffc 1080 0003 0100 0000 9010 2000 b010 0008 81c7 e008
0324500  91e8 0000 033f ffff 8200 6389 91e3 8001 f027 a044 f227 a048 f427 a04c d007 a044 d202 2044 d227 bffc c027 bff0 d407 a04c
0324560  8090 000a 0480 005f 0100 0000 d007 a048 d027 bff8 d207 a044 d202 6008 9010 200c 4000 2760 0100 0000 d027 bff4 d407 bff4
0324640  d607 bff8 d622 a004 d807 bff4 c023 2008 da07 bff4 de07 bff0 de23 4000 e007 bff4 e027 bff0 d407 bff8 9402 a02c d207 bffc
0324720  d007 bff4 9610 2000 7fff f5ee 0100 0000 8090 0008 1280 0006 0100 0000 1100 00fd 9012 2380 4000 0ebd 0100 0000 e207 bff8
0325000  e404 6004 e607 bff8 e804 c000 80a5 0012 1280 000d 0100 0000 ea07 bff8 ec05 6028 80a5 a1fc 0480 0008 0100 0000 d207 bff8
0325060  9202 602c 1100 00fd 9012 23a8 4000 0eab 0100 0000 ee07 bff8 f04d e018 b210 0018 b40e 60ff 80a6 a0fe 0680 0011 0100 0000
0325140  f607 bff8 f806 e01c 80a7 3fff 1280 000c 0100 0000 fa07 bff8 d007 6020 80a2 3fff 1280 0007 0100 0000 d207 bff8 d402 6024
0325220  80a2 bfff 0280 0006 0100 0000 1100 00fd 9012 23c8 4000 0e91 0100 0000 d007 bff8 9002 202c 4000 7da1 0100 0000 9602 2030
0325300  980a fffc d827 bfec da07 bfec de07 a048 9e03 c00d de27 a048 e007 bfec e207 a04c a224 4010 e227 a04c 10bf ffa1 0100 0000
0325360  e407 a044 e607 bff0 e624 a048 e807 a04c 8090 0014 1680 0006 0100 0000 1100 00fd 9012 23f5 4000 0e75 0100 0000 9010 2000
0325440  b010 0008 81c7 e008 81e8 0000 033f ffff 9200 6390 9de3 8001 f027 a044 1100 0129 d002 20e8 9002 2001 1300 0129 d022 60e8
0325520  1500 00fc d402 a384 8090 000a 0280 0006 0100 0000 1100 00fe 9012 2011 4000 0f67 0100 0000 1700 00fe 9612 e020 1900 0128
0325600  d623 23f8 da07 a044 da27 bffc de07 bffc 2100 0128 de24 23fc e207 bffc 8090 0011 1280 0006 0100 0000 1100 00fe 9012 2032
0325660  4000 0e4e 0100 0000 e407 bffc e654 a074 a624 e001 a72c e010 a73c e010 e634 a074 a810 0013 8090 0014 0480 0013 0100 0000
0325740  1100 0129 d002 20e8 9002 2001 1300 0129 d022 60e8 1500 00fc d402 a384 8090 000a 0280 0006 0100 0000 1100 00fe 9012 2050
0326020  4000 0f3e 0100 0000 9010 2000 1080 0081 0100 0000 1700 00fc 9612 e3c3 d627 bff8 d807 bff8 da03 0000 8090 000d 0280 0013
0326100  0100 0000 de07 bff8 e003 c000 e207 bffc 80a4 0011 1280 0008 0100 0000 e407 bff8 e607 bffc e804 c000 e824 8000 1080 0005
0326160  0100 0000 ea07 bff8 ec05 4000 ec27 bff8 10bf ffec 0100 0000 ee07 bffc f005 e048 f027 bff4 f207 bff4 8090 0019 0280 0021
0326240  0100 0000 f407 bff4 f606 a008 8090 001b 0280 0017 0100 0000 d007 bff4 d002 2008 4000 065c 0100 0000 1300 0129 d202 60e8
0326320  9202 6001 1500 0129 d222 a0e8 1700 00fc d602 e384 8090 000b 0280 0009 0100 0000 d807 bff4 d203 2004 9202 602c 1100 00fe
0326400  9012 2078 4000 0f01 0100 0000 da07 bff4 de03 4000 de27 bff4 10bf ffdf 0100 0000 e007 bffc e24c 2078 8090 0011 0280 001c
0326460  0100 0000 e407 bffc e64c a079 8090 0013 0280 0017 0100 0000 d007 bffc 4000 0064 0100 0000 d007 bffc 4000 0156 0100 0000
0326540  d007 bffc d207 bffc d402 6050 d422 2024 d007 bffc 9210 2000 7fff f5e6 0100 0000 d007 bffc 9002 2010 d607 bffc d402 e00c
0326620  9210 2034 7fff f784 0100 0000 d007 bffc c02b 2079 da17 bffc c023 6044 de07 bffc a010 3fff e023 e050 e207 bffc d004 600c
0326700  4000 7cea 0100 0000 e407 bffc d004 a008 4000 261c 0100 0000 2700 0129 e604 e0e8 a604 e001 2900 0129 e625 20e8 2b00 00fc
0326760  ea05 6384 8090 0015 0280 0006 0100 0000 1100 00fe 9012 20aa 4000 0ec0 0100 0000 9010 2000 1080 0003 0100 0000 9010 2000
0327040  b010 0008 81c7 e008 81e8 0000 033f ffff 8200 63b8 9de3 8001 f027 a044 d007 a044 d24a 207a 8090 0009 0280 0004 0100 0000
0327120  1080 0020 0100 0000 d407 a044 9602 a048 d627 bffc d807 bffc da03 0000 8090 000d 0280 0014 0100 0000 d007 bffc d202 0000
0327200  d402 6004 8090 000a 1280 0009 0100 0000 1607 bffc d807 bffc da03 0000 de03 4000 de22 c000 1080 0005 0100 0000 e007 bffc
0327260  e204 0000 e227 bffc 10bf ffeb 0100 0000 e407 a044 a610 2001 e62c a07a 9010 2000 b010 0008 81c7 e008 81e8 0000 033f ffff
0327340  8200 6370 9de3 8001 f027 a044 1100 0129 d002 20e8 9002 2001 1300 0129 d022 60e8 1500 00fc d402 a384 8090 000a 0280 0006
0327420  0100 0000 1100 00fe 9012 20bb 4000 0e7b 0100 0000 d607 a044 d802 e054 da07 a044 de03 6050 80a3 c00c 0280 0006 0100 0000
0327500  1100 00fe 9012 20cd 4000 0d68 0100 0000 e007 a044 e204 2030 e227 bfec e407 bfec 8090 0012 1280 0007 0100 0000 d007 a044
0327560  9210 3fff d222 2028 1080 00cb 0100 0000 1500 00fe 9412 a0ed 1700 00fc d422 e3d8 d807 a044 da03 200c da27 bff4 d007 bfec
0327640  9002 21fb 9210 21fc 4000 7c91 0100 0000 d027 bfe8 d007 a044 7fff f972 0100 0000 d027 bfe4 de07 a044 e007 bfe4 e023 e028
0327720  d007 a044 d207 bfe4 7fff f54e 0100 0000 e207 bfe4 a404 6001 e427 bfd8 e607 bfe8 a624 e001 e627 bfe8 8090 0013 0480 0007
0330000  0100 0000 d007 a044 7fff f95e 0100 0000 1080 0003 0100 0000 9010 3fff d027 bfe4 9027 a01c 9210 2004 d407 bff4 7fff f6de
0330060  0100 0000 a810 21fc e827 bfe0 c027 bfdc d007 a044 7fff ff7a 0100 0000 ea07 a044 ec05 6048 ec27 bffc ee07 bffc 8090 0017
0330140  0280 0068 0100 0000 d007 bffc d202 2004 d227 bff8 d407 bff8 8090 000a 1280 0006 0100 0000 1100 00fe 9012 20fc 4000 0d17
0330220  0100 0000 d007 bff8 9002 202c 4000 7c27 0100 0000 9602 2030 980a fffc d827 bff0 da07 bff0 de07 bfdc 9e03 c00d de27 bfdc
0330300  e007 bff8 e027 bfd4 e207 bfe0 e407 bff0 80a4 4012 1680 003d 0100 0000 d007 bfe0 8090 0008 0480 0007 0100 0000 d007 bfd4
0330360  d207 bfe0 d407 bff4 7fff f6ab 0100 0000 d207 bfe0 d407 bfd4 9402 8009 d427 bfd4 d607 bfe0 d807 bff0 9823 000b d827 bff0
0330440  da07 bfe4 8090 000d 1680 0006 0100 0000 1100 00fe 9012 211e 4000 0cec 0100 0000 de07 bfe4 e007 bfd8 80a3 c010 0280 0006
0330520  0100 0000 d007 a044 d207 bfe4 7fff f4ed 0100 0000 e207 bfe4 a404 6001 e427 bfd8 e607 bfe8 a624 e001 e627 bfe8 8090 0013
```

```
0330600  0480 0007 0100 0000 d007 a044 7fff f8fd 0100 0000 1080 0003 0100 0000 9010 3fff d027 bfe4 9027 a01c 9210 2004 d407 bff4
0330660  7fff f67d 0100 0000 a810 21fc e827 bfe0 10bf ffc2 0100 0000 d007 bfd4 d207 bff0 d407 bff4 7fff f674 0100 0000 ea07 bff0
0330740  ec07 bfe0 ac25 6015 ec27 bfe0 ee07 bffc f005 c000 f027 bffc 10bf ff98 0100 0000 f207 bfe8 8090 0019 1280 000b 0100 0000
0331020  d007 bfec f407 bfe0 9002 001a 9210 21fc 4000 7bf6 0100 0000 8090 0008 0280 0006 0100 0000 1100 00fe 9012 2146 4000 0cab
0331100  0100 0000 f607 a044 f806 e050 fa07 a044 d007 6054 80a2 001c 1680 0006 0100 0000 d007 bff4 d207 bfe0 7fff f517 0100 0000
0331160  d207 a044 d402 6030 d607 bfdc 80a2 800b 0280 0006 0100 0000 1100 00fe 9012 2163 4000 0c96 0100 0000 1900 00fc c023 23d8
0331240  9010 2000 b010 0008 81c7 e008 81e8 0000 033f ffff 8200 6380 9de3 8001 f027 a044 1100 0129 d002 20e8 9002 2001 1300 0129
0331320  d022 60e8 1500 00fc d402 a384 8090 000a 0280 0006 0100 0000 1100 00fe 9012 2199 4000 0486 0100 0000 1700 00fe 9612 e1a9
0331400  1900 00fc d623 23d8 da07 a044 d003 6064 9002 21fb 9210 21fc 4000 7bb5 0100 0000 d027 bffc d007 bffc 9002 2002 912a 2002
0331460  de07 a044 d203 e008 4000 24f6 0100 0000 d027 bfec c027 bff8 e007 bff8 e207 bffc 80a4 0011 1680 000e 0100 0000 d007 a044
0331540  7fff f888 0100 0000 e407 bff8 a72c a002 e807 bfec d025 0013 ea07 bff8 aa05 6001 ea27 bff8 10bf fff1 0100 0000 ec07 a044
0331620  d005 a064 9002 21fb 9210 21fc 4000 7b94 0100 0000 d027 bffc ee07 bff8 f007 bffc 80a5 c018 1680 001f 0100 0000 d007 a044
0331700  7fff f870 0100 0000 d207 bff8 952a 6002 d607 bfec d022 c001 d807 bff8 9803 2001 d827 bff8 da07 bff8 de07 bffc 80a3 400f
0331760  1280 000c 0100 0000 e007 a044 d004 2064 9002 21fb 9210 21fc 4000 7b79 0100 0000 e207 bff8 80a4 4008 0280 0006 0100 0000
0332040  1100 00fe 9012 21b5 4000 0c30 0100 0000 e407 bff8 a72c a002 e807 bfec aa10 3fff ea25 0013 ec07 a044 ee07 bfec f005 c000
0332120  f025 a02c f207 a044 f407 a044 f606 a064 f626 6034 f807 a044 fa07 205c fa27 bfe8 d007 a044 d202 200c d227 bfe4 153f fff6
0332200  9412 a0f0 d427 bff0 d607 bffc d627 bff8 d807 bff8 8090 000c 0480 002f 0100 0000 d007 bfec d202 0000 80a2 6001 1680 0006
0332260  0100 0000 1100 00fe 9012 21de 4000 0c0b 0100 0000 d407 bfec d602 8000 d627 bff4 d807 bfec 9803 2004 d827 bfec da07 bff4
0332340  de07 bff0 80a3 400f 0280 0006 0100 0000 d007 a044 d207 bff4 7fff f406 0100 0000 e007 bff4 a204 2001 e227 bff0 d007 bfec
0332420  9210 2004 d407 bfe4 7fff f5a3 0100 0000 d007 bfe8 9210 21fc d407 bfe4 7fff f59e 0100 0000 e407 bfe8 a404 a1fc e427 bfe8
0332500  e607 bff8 a624 e001 e627 bff8 10bf ff11 0100 0000 2900 00fc c025 23d8 9010 2000 b010 0008 81c7 e008 81e8 0000 033f ffff
0332560  8200 62b8 9de3 8001 f027 a044 f227 a048 f427 a04c c027 bffc d007 a04c d24a 0000 9410 0009 80a2 a077 1280 0006 0100 0000
0332640  1700 00fe 9612 e201 1080 0004 0100 0000 1700 00fe 9612 e204 d627 bf20 d807 a044 8090 000c 1280 0005 0100 0000 c02f bf28
0332720  1080 0069 0100 0000 d007 a044 d202 0000 d227 bf24 d407 a044 9402 a004 d427 a044 d607 bf24 8090 000b 0280 000e 0100 0000
0333000  d807 bf24 da4b 0000 9e10 000d 8090 000f 0280 0008 0100 0000 e007 bf24 e24c 0000 a410 0011 80a4 a03a 1280 001e 0100 0000
0333060  d007 bffc 8090 0008 1280 0018 0100 0000 9027 a0d8 1300 0102 d202 61d9 4000 7aa3 0100 0000 d007 a048 d207 bf20 7fff fb00
0333140  0100 0000 d027 bf1c d007 bffc 932a 2002 1500 0129 9412 a000 d607 bf1c d622 400a d807 bffc 9803 2001 d827 bffc 1b00 00fe
0333220  9a13 6207 da27 bf20 1080 0030 0100 0000 de07 bffc 8090 000f 1280 0006 0100 0000 9027 a0d8 d207 bf24 4000 7a88 0100 0000
0333300  9027 a074 d207 bf24 4000 7a84 0100 0000 9027 a074 1300 00fe 9212 620a 4000 7a9d 0100 0000 9027 a074 d207 a048 4000 7a99
0333360  0100 0000 9027 a074 d207 bf20 7fff fad8 0100 0000 d027 bf1c e007 bffc a32c 2002 2500 0129 a414 a000 e607 bf1c e624 4012
0333440  e807 bffc a805 2001 e827 bffc 2b00 00fe aa15 620c ea27 bf20 ec07 bffc 80a5 a014 1680 0006 0100 0000 ee07 bf1c 8090 0017
0333520  12bf ffa2 0100 0000 f007 bf1c 8090 0018 1280 0005 0100 0000 9010 2000 1080 00df 0100 0000 9027 a0d8 7fff b8fa 0100 0000
0333600  9027 a074 d207 a048 4000 7a54 0100 0000 9027 a074 1300 00fe 9212 620f 4000 7a6d 0100 0000 9227 a074 9010 2000 4000 1e65
0333660  0100 0000 d027 bff0 f207 bff0 8090 0019 0280 00c0 0100 0000 9010 2001 d027 bff4 9027 a074 d027 bf24 d207 bff0 d402 4000
0333740  9422 a001 d422 4000 8090 000a 0680 000b 0100 0000 d607 bff0 d802 e004 9803 2001 d822 e004 9a23 2001 de0b 4000 a010 000f
0334020  1080 0006 0100 0000 d007 bff0 4000 7a5f 0100 0000 a010 0008 e027 bff8 e207 bff8 80a4 6020 0280 0006 0100 0000 e407 bff8
0334100  80a4 a009 1280 0019 0100 0000 e607 bff0 e804 c000 a825 2001 e824 c000 8090 0014 0680 000b 0100 0000 ea07 bff0 ec05 6004
0334160  ac05 a001 ec25 6004 ae25 a001 f00d c000 b210 0018 1080 0006 0100 0000 d007 bff0 4000 7a42 0100 0000 b210 0008 f227 bff8
0334240  10bf ffe3 0100 0000 f407 bff8 80a6 bfff 0280 002b 0100 0000 f607 bff8 80a6 e020 0280 0027 0100 0000 f807 bff8 80a7 2009
0334320  0280 0023 0100 0000 fa07 bff8 80a7 600a 0280 001f 0100 0000 d007 bf24 d207 bff8 d22a 0000 d407 bf24 9402 a001 d427 bf24
0334400  d607 bff0 d802 c000 9823 2001 d822 c000 8090 000c 0680 000b 0100 0000 da07 bff0 de03 6004 9e03 e001 de23 6004 a023 e001
0334460  e20c 0000 a410 0011 1080 0006 0100 0000 d007 bff0 4000 7a15 0100 0000 a410 0008 e427 bff8 10bf ffd5 0100 0000 e607 bf24
0334540  c02c c000 9027 a074 7fff b87e 0100 0000 e84f bf8c aa10 0014 8090 0015 0280 003f 0100 0000 9027 a074 9227 a0d8 4000 79e5
0334620  0100 0000 8090 0008 0280 0038 0100 0000 9027 a074 1300 00fe 9212 6211 4000 79e9 0100 0000 9027 a074 d207 a048 4000 79e5
0334700  0100 0000 9027 a074 d207 bf20 7fff fa24 0100 0000 d027 bf1c d007 bf1c 8090 0008 0280 001c 0100 0000 d007 bffc 8090 0008
0334760  0480 000d 0100 0000 d207 bf1c 1500 0129 d402 a000 80a2 400a 1280 0007 0100 0000 d007 bf1c 7fff fc46 0100 0000 1080 000b
0335040  0100 0000 d607 bffc 992a e002 1b00 0129 9a13 6000 de07 bf1c de23 000d e007 bffc a004 2001 e027 bffc 1080 0009 0100 0000
0335120  e207 bff4 80a4 6001 1280 0005 0100 0000 9010 2000 1080 0021 0100 0000 1100 00fe 9012 2213 d027 bf20 d207 bff8 80a2 7fff
0335200  1280 0004 0100 0000 1080 000b 0100 0000 d407 bff8 80a2 a00a 1280 0005 0100 0000 d607 bff4 9602 e001 d627 bff4 10bf ff49
0335260  0100 0000 d007 bff0 4000 79ac 0100 0000 d807 bffc 9b2b 2002 1f00 0129 9e13 e000 c023 400f 1100 0129 9012 2000 1080 0003
0335340  0100 0000 9010 2000 b010 0008 81c7 e008 81e8 0000 033f ffff 8200 6399 9de3 8001 f027 a044 f227 a048 9027 a004 d207 a048
0335420  d202 6044 d407 a044 9610 2000 7fff f1b0 0100 0000 8090 0008 0280 0005 0100 0000 d007 bffc 1080 0006 0100 0000 9010 2000
0335500  1080 0003 0100 0000 9010 2000 b010 0008 81c7 e008 81e8 0000 033f ffff 8200 6398 9de3 8001 f027 a044 d007 a044 d202 2070
0335560  8090 0009 1280 000a 0100 0000 d007 a044 d202 2008 9010 2214 4000 22e2 0100 0000 d027 bffc 1080 0009 0100 0000 d007 a044
0335640  d202 2070 d227 bffc d407 a044 d607 bffc d802 e00c d822 a070 da07 bffc de07 a044 de23 4000 e007 bffc a210 3fff e224 2008
```

| | | | | | | | | | | | | | | | | | | | | | | | | |
|---|---|---|---|---|---|---|---|---|---|---|---|---|---|---|---|---|---|---|---|---|---|---|---|---|
| 0335720 | e407 | bffc | c034 | a010 | e607 | bffc | e807 | bffc | aa05 | 2214 | e424 | e00c | ec07 | bffc | ae10 | 3fff | ec25 | a014 | d007 | bffc | 1080 | 0003 | 0100 | 0000 |
| 0336000 | 9010 | 2000 | b010 | 0008 | 81c7 | e008 | 81e8 | 0000 | 033f | ffff | 8200 | 6398 | 9de3 | 8001 | f027 | a044 | f227 | a048 | d007 | a048 | 4000 | 7944 | 0100 | 0000 |
| 0336060 | 9002 | 2030 | 720a | 3ffc | d227 | bff8 | d407 | a044 | d202 | a008 | d007 | bff8 | 4000 | 22b2 | 0100 | 0000 | d027 | bffc | d007 | bffc | 9002 | 202c | d207 | a048 |
| 0336140 | 4000 | 791e | 0100 | 0000 | d607 | bffc | 9810 | 3fff | d822 | c000 | da07 | bffc | 9e10 | 3fff | de23 | 6004 | e007 | bffc | e207 | bffc | a410 | 3fff | e424 | 6024 |
| 0336220 | e424 | 2020 | e607 | bffc | e424 | e01c | e907 | bffc | c025 | 2028 | ea07 | a044 | ec07 | bff8 | ee05 | 6030 | ae05 | c016 | ee25 | 6030 | d007 | bffc | 1080 | 0003 |
| 0336300 | 0100 | 0000 | 9010 | 2000 | b010 | 0008 | 81c7 | e008 | 81e8 | 0000 | 033f | ffff | 8200 | 6388 | 9de3 | 8001 | f027 | a044 | f227 | a048 | f427 | a04c | 1100 | 0129 |
| 0336360 | d002 | 20e8 | 9002 | 2001 | 1300 | 0129 | d022 | 60e8 | 1500 | 00fc | d402 | a384 | 8090 | 000a | 0280 | 0008 | 0100 | 0000 | 1100 | 00fe | 9012 | 2216 | d207 | a048 |
| 0336440 | d407 | a04c | 4000 | 03f9 | 0100 | 0000 | 1700 | 00fe | 9612 | e235 | 1900 | 0128 | d623 | 23f8 | da07 | a044 | da27 | bffc | de07 | bffc | 2100 | 0128 | de24 | 23fc |
| 0336520 | e207 | bffc | 8090 | 0011 | 0280 | 000c | 0100 | 0000 | e407 | a048 | 8090 | 0012 | 0280 | 0008 | 0100 | 0000 | e607 | a04c | e84c | e001 | aa10 | 0014 | 8090 | 0015 |
| 0336600 | 0280 | 0006 | 0100 | 0000 | 1100 | 00fe | 9012 | 224e | 4000 | 09d6 | 0100 | 0000 | ec07 | a04c | ee4d | 8000 | ee2f | bff7 | f04f | bff7 | b210 | 0018 | 80a6 | 6072 |
| 0336660 | 0280 | 0012 | 0100 | 0000 | f44f | bff7 | b610 | 001a | 80a6 | e077 | 0280 | 000d | 0100 | 0000 | f84f | bff7 | ba10 | 001c | 80a7 | 6061 | 0280 | 0008 | 0100 | 0000 |
| 0336740 | d24f | bff7 | 1100 | 00fe | 9012 | 2270 | d407 | a048 | 4000 | 09be | 0100 | 0000 | d007 | bffc | d24a | 2079 | 8090 | 0009 | 1280 | 000c | 0100 | 0000 | d44f | bff7 |
| 0337020 | 9610 | 000a | 80a2 | e072 | 0280 | 0007 | 0100 | 0000 | 1100 | 00fe | 9012 | 229f | d207 | a048 | 4000 | 09af | 0100 | 0000 | d007 | a048 | d207 | bffc | 7fff | ff2e |
| 0337100 | 0100 | 0000 | d027 | bff0 | d807 | bff0 | 8090 | 000c | 1280 | 003e | 0100 | 0000 | d04f | bff7 | 9210 | 0008 | 80a2 | 6072 | 1280 | 0005 | 0100 | 0000 | 9010 | 2000 |
| 0337160 | 1080 | 0137 | 0100 | 0000 | 1500 | 0129 | d402 | a0e8 | 9402 | a001 | 1700 | 0129 | d422 | e0e8 | 1900 | 00fc | d803 | 2384 | 8090 | 000c | 0280 | 0007 | 0100 | 0000 |
| 0337240 | 1100 | 00fe | 9012 | 22de | d207 | a048 | 4000 | 0a97 | 0100 | 0000 | da07 | bffc | d203 | 6008 | 9010 | 200c | 4000 | 2214 | 0100 | 0000 | d027 | bff0 | de07 | bffc |
| 0337320 | e003 | e048 | e207 | bff0 | e024 | 4000 | e407 | bffc | e607 | bff0 | e624 | a048 | e807 | bff0 | c025 | 2008 | d007 | bffc | d207 | a048 | 7fff | ff46 | 0100 | 0000 |
| 0337400 | ea07 | bff0 | d025 | 6004 | ec07 | bff0 | d405 | a004 | 9402 | a02c | ee07 | bffc | d205 | e044 | d007 | bff0 | 9610 | 2000 | 7fff | f09b | 0100 | 0000 | f007 | bffc |
| 0337460 | c026 | 2038 | f207 | bffc | b410 | 2001 | f42e | 6078 | 1080 | 000c | 0100 | 0000 | f607 | bff0 | f806 | e008 | 8090 | 001c | 0280 | 0007 | 0100 | 0000 | 1100 | 00fe |
| 0337540 | 9012 | 22f3 | d207 | a048 | 4000 | 0960 | 0100 | 0000 | d007 | bffc | 7fff | fef9 | 0100 | 0000 | d027 | bff8 | d007 | bff0 | d207 | bff8 | d222 | 2008 | d407 | bff8 |
| 0337620 | d607 | bff0 | d622 | a004 | d807 | bff0 | d103 | 2004 | da27 | bfec | de4f | bff7 | a010 | 000f | 80a4 | 2072 | 1280 | 000b | 0100 | 0000 | d007 | bff8 | d207 | bfec |
| 0337700 | d402 | 4000 | d422 | 2014 | d607 | bff8 | 9810 | 2072 | d82a | e012 | 1080 | 00a0 | 0100 | 0000 | da4f | bff7 | 9e10 | 000d | 80a3 | e077 | 0280 | 0007 | 0100 | 0000 |
| 0337760 | e007 | bfec | e204 | 2028 | 8090 | 0011 | 1480 | 0056 | 0100 | 0000 | d007 | bff0 | d202 | 2004 | d007 | bffc | 4000 | 00d2 | 0100 | 0000 | d207 | bfec | 9410 | 3fff |
| 0340040 | d422 | 4000 | d607 | bfec | 9810 | 3fff | d822 | e004 | da07 | bfec | c023 | 6028 | de07 | bff8 | a010 | 2077 | e02b | e012 | d007 | bfec | 9002 | 2008 | 7fff | ed29 |
| 0340120 | 0100 | 0000 | 2300 | 00fc | e204 | 6388 | 8090 | 0011 | 0280 | 0031 | 0100 | 0000 | d007 | bfec | 9210 | 3ffe | d22a | 2018 | d407 | bfec | d64a | a010 | 9810 | 000b |
| 0340200 | 992b | 2001 | 9a10 | 000c | 9b2b | 6003 | 9820 | 000c | 9803 | 000d | de07 | bfec | e04b | e013 | a210 | 0010 | a404 | 400c | a604 | a02f | e807 | bfec | e62d | 2019 |
| 0340260 | ea07 | bfec | ec4d | 600e | ae10 | 0016 | b010 | 0017 | b12e | 2001 | ae05 | c018 | b12e | 2002 | ae05 | c018 | f207 | bfec | f44e | 6011 | b610 | 001a | b806 | c017 |
| 0340340 | ba1f | 20ae | d007 | bfec | fa2a | 201a | d207 | bfec | d44a | 6012 | 9610 | 000a | d807 | bfec | da4b | 200f | 9e10 | 000d | a12b | e002 | a204 | 000b | a410 | 20cf |
| 0340420 | a624 | 8011 | e807 | bfec | e62d | 201b | 1080 | 000c | 0100 | 0000 | d007 | bfec | 9210 | 3fff | d22a | 2018 | d407 | bfec | d607 | bfec | 9810 | 3fff | d82a | e01b |
| 0340500 | d82a | a01a | da07 | bfec | d82b | 6019 | 1080 | 0042 | 0100 | 0000 | d007 | bfec | d202 | 2004 | 8090 | 0009 | 1680 | 0007 | 0100 | 0000 | 1100 | 00fe | 9012 | 232a |
| 0340560 | d207 | a048 | 4000 | 09dd | 0100 | 0000 | d407 | bfec | 1292 | a004 | d007 | bffc | 7fff | f0e2 | 0100 | 0000 | d207 | bff8 | 9202 | 6014 | d007 | bffc | 7fff | f107 |
| 0340640 | 0100 | 0000 | d207 | bff8 | 9202 | 6018 | d007 | bfec | 9410 | 2000 | 7fff | f242 | 0100 | 0000 | d607 | bfec | d002 | e028 | 9022 | 2001 | 9210 | 21fc | 4000 | 780b |
| 0340720 | 0100 | 0000 | 9802 | 2001 | d827 | bfe8 | da07 | bff8 | de07 | bff8 | a003 | e018 | e207 | bfe8 | a404 | 0011 | e423 | 600c | e607 | bff8 | a810 | 21fc | ea07 | bfe8 |
| 0341000 | ac25 | 0015 | ec34 | e010 | ee07 | bfec | f007 | bfe8 | f205 | e028 | b226 | 4018 | f225 | e028 | f407 | bff8 | f607 | bfec | f806 | e004 | f826 | a008 | fa07 | bff8 |
| 0341060 | 9010 | 3fff | d027 | 6014 | d207 | bff8 | 9410 | 2077 | d42a | 6312 | d007 | bfec | 9002 | 2008 | 7fff | eca9 | 0100 | 0000 | d64f | bff7 | 9810 | 000b | 80a3 | 2072 |
| 0341140 | 0280 | 0037 | 0100 | 0000 | 1b00 | 00fc | da03 | 63d4 | 8090 | 000d | 0280 | 0032 | 0100 | 0000 | 1100 | 00fc | d002 | 23d4 | d207 | a048 | 4000 | 77a6 | 0100 | 0000 |
| 0341220 | 8090 | 0008 | 1280 | 002a | 0100 | 0000 | d007 | bff8 | 1300 | 00fc | d022 | 63cc | 1500 | 00fc | d402 | a3d0 | 8090 | 000a | 0280 | 0007 | 0100 | 0000 | d64f | bff7 |
| 0341300 | 9810 | 000b | 80a3 | 2077 | 1280 | 0006 | 0100 | 0000 | 1300 | 00fe | 9212 | 636a | 1080 | 0004 | 0100 | 0000 | 1300 | 00fe | 9212 | 636c | 1100 | 00fe | 9012 | 235a |
| 0341360 | 4000 | 776e | 0100 | 0000 | 1b00 | 00fc | d023 | 63d0 | 1f00 | 00fc | de03 | e3d0 | 8090 | 000f | 1280 | 0006 | 0100 | 0000 | 1100 | 00fe | 9012 | 236e | 4000 | 0873 |
| 0341440 | 0100 | 0000 | 1100 | 00fc | d002 | 23d0 | 9210 | 2000 | 9410 | 2002 | 4000 | 77d5 | 0100 | 0000 | d007 | bff8 | 1080 | 0003 | 0100 | 0000 | 9010 | 2000 | b010 | 0008 |
| 0341520 | 81c7 | e008 | 81e8 | 0000 | 033f | ffff | 8200 | 6390 | 9de3 | 8001 | f027 | a044 | f227 | a048 | d007 | a048 | d202 | 2028 | 8090 | 0009 | 0480 | 0007 | 0100 | 0000 |
| 0341600 | d407 | a044 | d64a | a07b | 8090 | 000b | 0280 | 0004 | 0100 | 0000 | 1090 | 005e | 0100 | 0000 | 1900 | 00fe | 9813 | 2391 | 1b00 | 00fc | d823 | 63d8 | de07 | a048 |
| 0341660 | e003 | c000 | e027 | bffc | e207 | a048 | e404 | 6004 | e607 | bffc | 80a4 | c012 | 0280 | 003f | 0100 | 0000 | d007 | bffc | 8090 | 0008 | 1680 | 0008 | 0100 | 0000 |
| 0341740 | d207 | a048 | 9202 | 602c | 1100 | 00fe | 9012 | 239d | 4000 | 083e | 0100 | 0000 | d007 | a044 | d207 | bffc | 7fff | f518 | 0100 | 0000 | d007 | a044 | d207 | bffc |
| 0342020 | 7fff | f040 | 0100 | 0000 | 9227 | a004 | d227 | bff4 | 9410 | 2004 | d427 | bff8 | d607 | bff8 | 8090 | 000b | 0480 | 0023 | 0100 | 0000 | d807 | a044 | da03 | 200c |
| 0342100 | de03 | 4000 | 9e23 | e001 | de23 | 4000 | 8090 | 000f | 0680 | 000c | 0100 | 0000 | e007 | a044 | e204 | 200c | e404 | 6004 | a404 | a001 | e424 | 6004 | a624 | a001 |
| 0342160 | e80c | c000 | aa10 | 0014 | 1080 | 0007 | 0100 | 0000 | ec07 | a044 | d005 | a00c | 4000 | 7744 | 0100 | 0000 | aa10 | 0008 | ee07 | bff4 | ea2d | c000 | f007 | bff4 |
| 0342240 | b006 | 2001 | f027 | bff4 | f207 | bff8 | b226 | 6001 | f227 | bff8 | 10bf | ffdd | 0100 | 0000 | 10bf | ffbf | 0100 | 0000 | d007 | a044 | d207 | bffc | 7fff | f4e5 |
| 0342320 | 0100 | 0000 | f407 | a044 | b610 | 2001 | f62e | a078 | f807 | a048 | ba10 | 3fff | fa27 | 0000 | d007 | a048 | 9210 | 3fff | d222 | 2004 | d407 | a048 | c022 | a028 |
| 0342400 | 1700 | 00fc | c022 | e348 | 9010 | 2000 | b010 | 0008 | 81c7 | e008 | 81e8 | 0000 | 033f | ffff | 8200 | 63a0 | 9de3 | 8001 | f027 | a044 | d007 | a044 | d202 | 2008 |
| 0342460 | 80a2 | 7fff | 1280 | 0004 | 0100 | 0000 | 1080 | 003a | 0100 | 0000 | d407 | a044 | d602 | a004 | d802 | e004 | da07 | a044 | de03 | 6008 | de23 | 2004 | e007 | a044 |
| 0342540 | a210 | 3fff | e224 | 2014 | e407 | a044 | a604 | a018 | e807 | a044 | ea05 | 200c | ac25 | 4013 | ee07 | a044 | f005 | e004 | f206 | 2004 | f406 | 6028 | b406 | 8016 |
| 0342620 | f426 | 6028 | f607 | a044 | f806 | e004 | d007 | 2004 | d207 | a044 | 9202 | 6018 | 9410 | 2001 | 7fff | f144 | 0100 | 0000 | fa07 | a044 | 1100 | 00fc | d002 | 23cc |
| 0342700 | 80a7 | 4008 | 1280 | 000f | 0100 | 0000 | 1300 | 0129 | d202 | 60d4 | 8090 | 0009 | 0280 | 000a | 0100 | 0000 | d407 | a044 | d402 | a008 | 1300 | 00fe | 9212 | 63bd |
| 0342760 | 1100 | 0124 | d002 | 2264 | 4000 | 76b5 | 0100 | 0000 | d607 | a044 | d202 | e008 | d407 | a044 | 9402 | a014 | d807 | a044 | d003 | 0000 | 7fff | f079 | 0100 | 0000 |

| | | | | | | | | | | | | | | | | | | | | | | | | |
|---|---|---|---|---|---|---|---|---|---|---|---|---|---|---|---|---|---|---|---|---|---|---|---|---|
| 0343040 | 9010 | 2000 | b010 | 0008 | 81c7 | e008 | 81e8 | 0000 | 033f | ffff | 8200 | 6398 | 9de3 | 8001 | f027 | a044 | 1100 | 0129 | d002 | 20e8 | 9002 | 2001 | 1300 | 0129 |
| 0343120 | d022 | 60e8 | 1500 | 00fc | d402 | a384 | 8090 | 000a | 0280 | 0006 | 0100 | 0000 | 1100 | 00fe | 9012 | 23c1 | 4000 | 08a6 | 0100 | 0000 | 1700 | 00fe | 9612 | e3d0 |
| 0343200 | 1900 | 0128 | d623 | 23f8 | da07 | a044 | da27 | bffc | de07 | bffc | 8090 | 000f | 1280 | 0008 | 0100 | 0000 | 1100 | 0128 | c022 | 23fc | 1100 | 00fe | 9012 | 23e9 |
| 0343260 | 4000 | 078e | 0100 | 0000 | d207 | bffc | d402 | 4000 | 1700 | 0128 | d422 | e3fc | d807 | bffc | da03 | 2004 | c023 | 6008 | de07 | bffc | e04b | e012 | a210 | 0010 |
| 0343340 | 80a4 | 6077 | 1280 | 0005 | 0100 | 0000 | d007 | bffc | 7fff | ff8a | 0100 | 0000 | e407 | bffc | e607 | bffc | e804 | c000 | ea05 | 2070 | ea24 | a00c | ec07 | bffc |
| 0343420 | ee05 | 8000 | f007 | bffc | f025 | e070 | f207 | bffc | b410 | 2063 | f42e | 6012 | 3700 | 00fc | f606 | e3cc | f807 | bffc | 80a6 | c01c | 1280 | 0012 | 0100 | 0000 |
| 0343500 | 1100 | 00fc | c022 | 23cc | 1100 | 00fc | d002 | 23d0 | 1300 | 00ff | 9212 | 6006 | 1500 | 0129 | d402 | a0e0 | 1700 | 0129 | d602 | e0e4 | 4000 | 7659 | 0100 | 0000 |
| 0343560 | 1100 | 00fc | d002 | 23d0 | 4000 | 767c | 0100 | 0000 | 9010 | 2000 | 1080 | 0003 | 0100 | 0000 | 9010 | 2000 | b010 | 0008 | 81c7 | e008 | 81e8 | 0000 | 033f | ffff |
| 0343640 | 8200 | 6398 | 9de3 | 8001 | f027 | a044 | f227 | a048 | 1100 | 0129 | d002 | 20e8 | 9002 | 2001 | 1300 | 0129 | d022 | 60e8 | 1500 | 00fc | d402 | a384 | 8090 | 000a |
| 0343720 | 0280 | 0007 | 0100 | 0000 | 1100 | 00ff | 9012 | 201f | d207 | a048 | 4000 | 0849 | 0100 | 0000 | 1700 | 00ff | 9612 | e034 | 1900 | 0128 | d623 | 23f8 | da07 | a044 |
| 0344000 | da27 | bffc | de07 | bffc | 2100 | 0128 | de24 | 23fc | e207 | bffc | 8090 | 0011 | 1280 | 0006 | 0100 | 0000 | 1100 | 00ff | 9012 | 204e | 4000 | 0730 | 0100 | 0000 |
| 0344060 | e407 | bffc | e64c | a079 | 8090 | 0013 | 1280 | 0006 | 0100 | 0000 | 1100 | 00ff | 9012 | 206c | 4000 | 0727 | 0100 | 0000 | d007 | a048 | d207 | bffc | 7fff | fca6 |
| 0344140 | 0100 | 0000 | d027 | bff8 | e807 | bff8 | 8090 | 0014 | 1280 | 0005 | 0100 | 0000 | 9010 | 3fff | 1080 | 002b | 0100 | 0000 | ea07 | bff8 | ec05 | 6008 | 8090 | 0016 |
| 0344220 | 0280 | 0007 | 0100 | 0000 | 1100 | 00ff | 9012 | 209b | d207 | a048 | 4000 | 0711 | 0100 | 0000 | ee07 | bff8 | d205 | e004 | d007 | bffc | 7fff | fea8 | 0100 | 0000 |
| 0344300 | f007 | bff8 | c026 | 2004 | f207 | bffc | d006 | 6044 | d207 | a048 | 9410 | 2000 | 7fff | ee54 | 0100 | 0000 | d007 | a048 | 4000 | 7615 | 0100 | 0000 | ba02 | 2030 |
| 0344360 | ba0f | 7ffc | f407 | bffc | f606 | a030 | b626 | c01d | f626 | a030 | f807 | bffc | ba10 | 2001 | fa2f | 2078 | d007 | bffc | c02a | 207a | 9010 | 2000 | 1080 | 0003 |
| 0344440 | 0100 | 0000 | 9010 | 2000 | b010 | 0008 | 81c7 | e008 | 81e8 | 0000 | 033f | ffff | 8200 | 6398 | 9de3 | 8001 | f027 | a044 | 1100 | 00ff | 9012 | 20c2 | 1300 | 0128 |
| 0344520 | d022 | 63f8 | d407 | a044 | d602 | 8000 | 1900 | 0128 | d623 | 23fc | da07 | a044 | de03 | 6004 | e003 | e004 | e027 | bffc | e207 | a044 | e404 | 6014 | 8090 | 0012 |
| 0344600 | 1680 | 0005 | 0100 | 0000 | 9010 | 3fff | 1080 | 0053 | 0100 | 0000 | e607 | a044 | e807 | a044 | ea05 | 2014 | ea24 | e008 | ec07 | a044 | d205 | a008 | ee07 | a044 |
| 0344660 | d005 | c000 | 7fff | eed7 | 0100 | 0000 | d207 | a044 | 9202 | 6014 | f007 | a044 | d006 | 0000 | 7fff | eefb | 0100 | 0000 | d207 | a044 | 9202 | 6018 | d007 | bffc |
| 0344740 | 9410 | 2000 | 7fff | f036 | 0100 | 0000 | f207 | bffc | f406 | 6004 | f607 | a044 | f806 | e008 | 80a7 | 001a | 1280 | 0005 | 0100 | 0000 | ba10 | 2001 | 1080 | 0003 |
| 0345020 | 0100 | 0000 | ba10 | 2000 | d007 | a044 | d202 | 2014 | 8090 | 0009 | 1680 | 0005 | 0100 | 0000 | 9410 | 2001 | 1080 | 0003 | 0100 | 0000 | 9410 | 2000 | 80a7 | 400a |
| 0345100 | 0280 | 0008 | 0100 | 0000 | d207 | bffc | 9202 | 602c | 1100 | 00ff | 9012 | 20d9 | 4000 | 06a4 | 0100 | 0000 | d607 | a044 | d802 | e014 | 8090 | 000c | 1680 | 000a |
| 0345160 | 0100 | 0000 | da07 | bffc | d003 | 6028 | 9022 | 2001 | 9210 | 21fc | 4000 | 75dd | 0100 | 0000 | 1080 | 0003 | 0100 | 0000 | 9010 | 21fb | de07 | a044 | d033 | e010 |
| 0345240 | e007 | a044 | e207 | a044 | a404 | 6018 | e424 | 200c | e607 | a044 | e804 | e00c | a805 | 2001 | e824 | e00c | aa25 | 2001 | d04d | 4000 | 900a | 20ff | 1080 | 0003 |
| 0345320 | 0100 | 0000 | 9010 | 2000 | b010 | 0008 | 81c7 | e008 | 81e8 | 0000 | 033f | ffff | 8200 | 63a0 | 9de3 | 8001 | f027 | a044 | fa07 | a044 | 8090 | 001d | 0280 | 0007 |
| 0345400 | 0100 | 0000 | d04f | 6012 | 9210 | 0008 | 80a2 | 6072 | 0280 | 0009 | 0100 | 0000 | d007 | a044 | 1300 | 00ff | 9212 | 60fb | 1500 | 00ff | 9412 | a101 | 4000 | 05d0 |
| 0345460 | 0100 | 0000 | d057 | 6010 | 9022 | 2001 | 912a | 2010 | 913a | 2010 | d037 | 6010 | 8090 | 0008 | 1680 | 0007 | 0100 | 0000 | 9010 | 001d | 7fff | ff77 | 0100 | 0000 |
| 0345540 | 1080 | 0008 | 0100 | 0000 | d407 | 600c | 9402 | a001 | d427 | 600c | 9622 | a001 | d04a | c000 | 900a | 20ff | 1080 | 0003 | 0100 | 0000 | 9010 | 2000 | b010 | 0008 |
| 0345620 | 81c7 | e008 | 81e8 | 0000 | 033f | ffff | 8200 | 6398 | 9de3 | 8001 | f027 | a044 | f227 | a048 | d007 | a048 | d027 | bffc | d207 | bffc | 8090 | 0009 | 0280 | 0012 |
| 0345700 | 0100 | 0000 | d407 | bffc | d64a | a012 | 9810 | 000b | 80a3 | 2072 | 1280 | 000c | 0100 | 0000 | da07 | bffc | de53 | 6010 | 9e03 | e001 | 9f2b | e010 | 9f3b | e010 |
| 0345760 | de33 | 6010 | a010 | 000f | 80a4 | 21fc | 0480 | 0009 | 0100 | 0000 | d007 | a048 | 1300 | 00ff | 9212 | 6106 | 1500 | 00ff | 9412 | a10e | 4000 | 0595 | 0100 | 0000 |
| 0346040 | e207 | bffc | e404 | 600c | a424 | a001 | e424 | 600c | e607 | a044 | e62c | 8000 | 9010 | 2000 | b010 | 0008 | 81c7 | e008 | 81e8 | 0000 | 033f | ffff | 8200 | 6390 |
| 0346120 | 9de3 | 8001 | f02f | a047 | f227 | a048 | 1100 | 00ff | 9012 | 2113 | 1300 | 0128 | d022 | 63f8 | d407 | a048 | d602 | a004 | d802 | e004 | d827 | bff4 | da07 | a048 |
| 0346200 | de03 | 4000 | de27 | bffc | e007 | bffc | 2300 | 0128 | e024 | 63fc | d007 | bffc | 7fff | f23a | 0100 | 0000 | d027 | bff8 | e407 | a048 | 2700 | 00fc | e604 | e3cc |
| 0346260 | 80a4 | 8013 | 1280 | 000e | 0100 | 0000 | 2900 | 0129 | e805 | 20d4 | 8090 | 0014 | 0280 | 0009 | 0100 | 0000 | 1100 | 0124 | d002 | 226c | 1300 | 00ff | 9212 | 612a |
| 0346340 | d407 | bff8 | 4000 | 74fa | 0100 | 0000 | ea07 | a048 | ec05 | 6008 | 80a5 | bfff | 1280 | 0009 | 0100 | 0000 | d007 | bff4 | d207 | bff8 | d222 | 0000 | d407 | bff4 |
| 0346420 | c022 | a028 | 1080 | 0029 | 0100 | 0000 | d007 | a048 | d207 | bff8 | d222 | 2014 | d207 | a048 | 9202 | 6018 | d007 | bff4 | 9410 | 2001 | 7fff | ef61 | 0100 | 0000 |
| 0346500 | d407 | a048 | 1700 | 00fc | d602 | e3cc | 80a2 | 800b | 1280 | 000f | 0100 | 0000 | 1900 | 0129 | d803 | 20d4 | 8090 | 000c | 0280 | 000a | 0100 | 0000 | da07 | a048 |
| 0346560 | d403 | 6008 | 1300 | 00ff | 9212 | 612e | 1100 | 0124 | d002 | 2264 | 4000 | 74d2 | 0100 | 0000 | de07 | a048 | d203 | e008 | d407 | a048 | 9402 | a014 | d007 | bffc |
| 0346640 | 7fff | ee97 | 0100 | 0000 | e007 | bff4 | e204 | 2028 | a204 | 61fc | e224 | 2028 | e407 | a048 | e607 | bff8 | e624 | a008 | e807 | a048 | aa10 | 3fff | ea25 | 2014 |
| 0346720 | ec07 | a048 | ae10 | 21fb | ee35 | a010 | f007 | a048 | f207 | a048 | b406 | 6018 | f426 | 200c | f607 | a048 | f806 | e00c | b807 | 2001 | f826 | e00c | ba27 | 2001 |
| 0347000 | d04f | a047 | d02f | 4000 | 9010 | 2000 | b010 | 0008 | 81c7 | e008 | 81e8 | 0000 | 033f | ffff | 8200 | 63a0 | 9de3 | 8001 | f027 | a044 | f227 | a048 | fa07 | a048 |
| 0347060 | 8090 | 001d | 0280 | 0007 | 0100 | 0000 | d04f | 6012 | 9210 | 0008 | 80a2 | 6077 | 0280 | 0009 | 0100 | 0000 | d007 | a048 | 1300 | 00ff | 9212 | 6132 | 1500 | 00ff |
| 0347140 | 9412 | a138 | 4000 | 0502 | 0100 | 0000 | 1500 | 00fc | d402 | a3cc | 80a7 | 400a | 1280 | 005f | 0100 | 0000 | 1100 | 0129 | d002 | 20d0 | 8090 | 0008 | 0280 | 004b |
| 0347220 | 0100 | 0000 | 1300 | 00fc | d202 | 63d0 | d402 | 4000 | 9422 | a001 | d422 | 4000 | 8090 | 000a | 0680 | 000e | 0100 | 0000 | 1700 | 00fc | d602 | e3d0 | d802 | e004 |
| 0347300 | 9803 | 2001 | d822 | e004 | 9a23 | 2001 | de07 | a044 | a00b | e0ff | e02b | 4000 | a210 | 0010 | 1080 | 0037 | 0100 | 0000 | 2500 | 00fc | e404 | a3d0 | e654 | a010 |
| 0347360 | a810 | 0013 | 808d | 2080 | 0280 | 0029 | 0100 | 0000 | 2b00 | 00fc | ea05 | 63d0 | ec05 | 600c | 2f00 | 00fc | ee05 | e3d0 | f005 | c000 | b220 | 0018 | 80a6 | 4016 |
| 0347440 | 1680 | 001f | 0100 | 0000 | 3500 | 00fc | f406 | a3d0 | f606 | a004 | e207 | a044 | a20c | 60ff | e22e | c000 | 80a4 | 600a | 0280 | 000b | 0100 | 0000 | 3900 | 00fc |
| 0347520 | f807 | 23d0 | d007 | 2004 | 9002 | 2001 | d027 | 2004 | 9222 | 2001 | e20a | 4000 | 1080 | 000b | 0100 | 0000 | 1500 | 00fc | d402 | a3d0 | d602 | a004 | d00a | c000 |
| 0347600 | 1300 | 00fc | d202 | 63d0 | 4000 | 7487 | 0100 | 0000 | a210 | 0008 | 1080 | 0009 | 0100 | 0000 | d007 | a044 | 900a | 20ff | 1300 | 00fc | d202 | 63d0 | 4000 | 747e |
| 0347660 | 0100 | 0000 | a210 | 0008 | 1900 | 0129 | d803 | 20e0 | 9803 | 2001 | 1b00 | 0129 | d823 | 60e0 | de57 | 6010 | a010 | 000f | 8090 | 0010 | 1480 | 0007 | 0100 | 0000 |
| 0347740 | 2300 | 0129 | e204 | 60e4 | a204 | 6001 | 2500 | 0129 | e224 | a0e4 | e657 | 6010 | a624 | e001 | a72c | e010 | a73c | e010 | e637 | 6010 | a810 | 0013 | 8090 | 0014 |
| 0350020 | 1680 | 0008 | 0100 | 0000 | d007 | a044 | 9210 | 001d | 7fff | ff0a | 0100 | 0000 | 1080 | 0008 | 0100 | 0000 | ea07 | 600c | ec07 | a044 | ec2d | 4000 | ee07 | 600c |
| 0350100 | ae05 | e001 | ee27 | 600c | d007 | a044 | 900a | 20ff | 1080 | 0003 | 0100 | 0000 | 9010 | 2000 | b010 | 0008 | 81c7 | e008 | 81e8 | 0000 | 033f | ffff | 8200 | 6388 |

```
0350160  93e3 8001 f227 a048 f427 a04c f627 a050 d007 a050 8090 0009 0280 000d 0100 0000 d207 a048 8090 0009 0480 0009 0100 0000
0350240  d407 a04c 8090 000a 0480 0005 0100 0000 8090 0018 1280 0009 0100 0000 d007 a050 1300 00ff 9212 613d 1500 00ff 9412 a143
0350320  4000 0467 0100 0000 d607 a050 d627 bfec d807 bfec da4b 2012 9e10 0001 80a3 e072 0280 0005 0100 0000 9010 2000 1080 0061
0350400  0100 0000 e007 bfec e204 200c b310 0011 c027 bff8 e407 bff8 e607 a04c 80a4 8013 1680 0054 0100 0000 d007 a048 d027 bffc
0350460  d007 bfec d252 2010 9410 0009 d427 bff0 d607 bff0 d807 bffc 80a2 c00c 1680 0005 0100 0000 da07 bff0 1080 0003 0100 0000
0350540  da07 bffc ba10 000d de07 bfec e003 e00c a004 001d e023 e00c e207 bfec a52f 6010 a53c a010 e654 6010 a624 c012 a72c e010
0350620  a73c e010 e634 6010 e807 bffc a825 001d e827 bffc ba27 6001 8090 001d 0680 0008 0100 0000 ea4f 0000 ea2e 0000 b807 2001
0350700  b006 2001 10bf fff8 0100 0000 f207 bffc 8090 0019 1480 0004 0100 0000 1080 0020 0100 0000 f407 bfec f656 a010 b626 e001
0350760  b72e e010 b73e e010 f636 a010 d007 bfec 7fff fdcd 0100 0000 d027 bff4 d007 bff4 80a2 3fff 1280 0005 0100 0000 d007 bff8
0351040  1080 0018 0100 0000 d207 bff4 d22e 0000 b006 2001 d627 bffc 9622 e001 d627 bffc d807 bfec da03 200c b810 000d de07 bffc
0351120  8090 000f 14bf ffb7 0100 0000 e007 bff8 a004 2001 e027 bff8 10bf ffab 0100 0000 d007 bff8 1080 0003 0100 0000 9010 2000
0351260  d207 bffc 8090 0009 0280 001a 0100 0000 d407 bffc d64a a012 9810 000b 80a3 2072 1280 0014 0100 0000 da07 a04c 80a3 6001
0351340  0480 0010 0100 0000 de07 a044 8090 000f 0280 000c 0100 0000 e007 a048 8090 0010 0280 0008 0100 0000 e207 a048 e44c 4000
0351420  a610 0012 8090 0013 1280 0009 0100 0000 d007 a050 1300 00ff 9212 6148 1500 00ff 9412 a14e 4000 03ce 0100 0000 e807 a048
0351500  ea4d 0000 ac10 0015 80a5 a045 1280 0005 0100 0000 ae10 2001 1080 0003 0100 0000 ae10 2000 ee27 bff8 f007 a048 b006 2001
0351560  f027 a048 f207 a048 d04e 4000 9210 0008 80a2 6059 1280 0005 0100 0000 9410 2001 1080 0003 0100 0000 9410 2000 1700 0129
0351640  d42a e0f0 d807 a048 9803 2001 d827 a048 fa07 a048 da4f 4000 9e10 000d 8090 000f 0280 000c 0100 0000 e04f 4000 a210 0010
0351720  a40c 60ff 2700 0129 a614 e0f0 a810 2001 e82c 8013 ba07 6001 10bf fff3 0100 0000 ac10 3ffe 2f00 0124 ec25 e268 f007 a04c
0352000  b026 2001 f027 a04c fa07 a044 d007 bffc d202 200c b810 0009 d407 bffc d652 a010 9810 000b da07 a04c 80a3 000d 1680 0007
0352060  0100 0000 de07 bffc e053 e010 a210 0010 1080 0003 0100 0000 e207 a04c b610 0011 b626 e001 8090 001b 0680 0015 0100 0000
0352140  d04f 0000 9210 0008 940a 60ff b410 000a b807 2001 f42f 4000 ba07 6001 1b00 0129 9a13 60f0 de4e 800d 8090 000f 0280 0006
0352220  0100 0000 1100 0124 f422 2268 1080 0004 0100 0000 10bf ffeb 0100 0000 d207 bffc d402 600c 9627 000a b410 000b d807 bffc
0352300  f823 200c da07 bffc 9f2e a010 9f3b e010 e053 6010 a024 000f a12c 2010 a13c 2010 e033 6010 e207 a04c a224 401a e227 a04c
0352360  8090 001b 1680 0006 0100 0000 e407 a04c 8090 0012 1480 0004 0100 0000 1080 001a 0100 0000 e607 bffc e854 e010 a825 2001
0352440  a92d 2010 a93d 2010 e834 e010 d007 bffc 7fff fd01 0100 0000 b410 0008 80a6 bfff 1280 0007 0100 0000 9010 3fff 1300 0124
0352520  d022 6268 1080 0008 0100 0000 9010 001a d207 a050 7fff fd8d 0100 0000 10bf ffa8 0100 0000 d407 bff8 8090 000a 0280 000c
0352600  0100 0000 1700 0124 d602 e268 8090 000b 0680 0007 0100 0000 ba27 6001 d04f 4000 d207 a050 7fff fd7d 0100 0000 c02f 4000
0352660  ba07 6001 da07 a044 9e27 400d b610 000f 2100 0129 c02c 20f0 fa07 a048 e24f 4000 a410 0011 8090 0012 0280 000b 0100 0000
0352740  e64f 4000 a810 0013 aa0d 20ff 2d00 0129 ac15 a0f0 c02d 4016 ba07 6001 10bf fff4 0100 0000 9010 001b 1080 0003 0100 0000
0353020  9010 2000 b010 0008 81c7 e008 81e8 0000 033f ffff 8200 6398 9de3 8001 f027 a044 f227 a048 d007 a048 8090 0008 1280 0005
0353100  0100 0000 9210 2000 1080 0004 0100 0000 d407 a048 d202 8000 b410 0009 8090 001a 0280 000b 0100 0000 d64e a012 9810 000b
0353160  80a3 2072 1280 0006 0100 0000 da07 a044 8090 000d 1280 0009 0100 0000 9010 001a 1300 00ff 9212 6153 1500 00ff 9412 a15e
0353240  4000 02f3 0100 0000 9e10 2100 de27 bffc f807 a044 fa06 a00c d056 a010 9210 0008 d407 bffc 80a2 400a 1680 0006 0100 0000
0353320  d656 a010 9810 000b 1080 0003 0100 0000 d807 bffc b610 000c da06 a00c 9a03 401b da26 a00c 9f2e e010 9f3b e010 e056 a010
0353400  a024 000f a12c 2010 a13c 2010 e036 a010 e207 bffc a224 401b e227 bffc b626 e001 8090 001b 0680 0008 0100 0000 e44f 4000
0353460  e42f 0000 ba07 6001 b807 2001 10bf fff8 0100 0000 ea07 bffc 8090 0015 1480 0005 0100 0000 9010 2100 1080 001a 0100 0000
0353540  ec56 a010 ac25 a001 ad2d a010 ad3d a010 ec36 a010 9010 001a 7fff fc6f 0100 0000 b610 0008 80a6 ffff 1280 0007 0100 0000
0353620  9010 2100 ee07 bffc 9022 0017 1080 0009 0100 0000 9010 001b 9210 001a 7fff fcfb 0100 0000 10bf ffc0 0100 0000 9010 2000
0353700  b010 0008 81c7 e008 81e8 0000 033f ffff 8200 63a0 9de3 8001 f027 a044 f227 a048 f427 a04c f627 a050 d007 a050 8090 0008
0353760  0280 0008 0100 0000 d207 a050 d44a 6012 9610 000a 80a2 e077 0280 0009 0100 0000 d007 a050 1300 00ff 9212 6163 1500 00ff
0354040  9412 a16a 4000 0292 0100 0000 f807 a04c 8090 001c 0480 0014 0100 0000 fa07 a048 8090 001d 0480 000d 0100 0000 d807 a044
0354120  9803 2001 d827 a044 9a23 2001 d04b 4000 d207 a050 7fff fd63 0100 0000 ba27 6001 10bf fff4 0100 0000 b827 2001 10bf ffed
0354200  0100 0000 d007 a04c 1080 0003 0100 0000 9010 2000 b010 0008 81c7 e008 81e8 0000 033f ffff 8200 6290 9de3 8001 f027 a044
0354260  f227 a048 f427 a04c f627 a050 f827 a054 fa27 a058 d007 a044 8090 0008 0280 0008 0100 0000 d207 a044 d44a 6012 9610 000a
0354340  80a2 e077 0280 0009 0100 0000 d007 a044 1300 00ff 9212 616f 1500 00ff 9412 a177 4000 025b 0100 0000 d807 a05c d823 a05c
0354420  da07 a060 da23 a060 9027 a104 d207 a048 d407 a04c d607 a050 d807 a054 da07 a058 4000 71e1 0100 0000 c02f bffc 9e27 a104
0354500  de27 bef8 e007 bef8 e24c 0000 a410 0011 8090 0012 0280 000c 0100 0000 e607 bef8 a604 e001 e627 bef8 a824 e001 d04d 0000
0354560  d207 a044 7fff fd29 0100 0000 10bf fff2 0100 0000 9010 2000 b010 0008 81c7 e008 81e8 0000 033f ffff 8200 63a0 9de3 8001
0354640  f027 a044 f227 a048 d007 a044 d002 2004 9002 202c d207 a048 d202 6004 9202 602c 4000 71d8 0100 0000 8090 0008 1680 0005
0354720  0100 0000 9010 2001 1080 0003 0100 0000 9010 2000 1080 0003 0100 0000 9010 2000 b010 0008 81c7 e008 81e8 0000 033f ffff
0355000  8200 6390 9de3 8001 f027 a044 f227 a048 1100 0129 d002 20e8 9002 2001 1300 0129 d022 60e8 1500 00fc d402 a384 8090 000a
0355060  0280 0006 0100 0000 1100 00ff 9012 217c 4000 03b2 0100 0000 d607 a044 d627 bffc d807 bffc 8090 000c 1280 0005 0100 0000
0355140  9010 2000 1080 004e 0100 0000 d007 bffc 7fff f4ef 0100 0000 da07 bffc de03 6048 8090 000f 1280 0005 0100 0000 9010 2000
0355220  1080 0043 0100 0000 e007 a048 80a4 2001 0280 0007 0100 0000 e207 bffc e404 604c 8090 0012 1280 001c 0100 0000 d007 bffc
```

```
0355300 d202 2038 8090 0009 1280 0011 0100 0000 d007 bffc d202 2048 d227 bff4 d007 bff4 d207 bff4 9410 2000 1700 007e 9612 e194
0355360 4000 1e01 0100 0000 d407 bffc d022 a048 d607 bffc 9810 2001 d322 e038 da07 bffc de07 bffc e003 e048 e023 604c 1080 0007
0355440 0100 0000 d007 bffc d207 bffc d402 604c d602 8000 d622 204c d807 bffc da03 204c 8090 000d 1280 0005 0100 0000 9010 2000
0355520 1080 0013 0100 0000 de07 bffc e003 e04c e204 2004 e227 bff8 e407 bff8 a604 a02c 2900 0129 e625 21f0 ea07 bff8 ec05 6028
0355600 2f00 0129 ec25 e1f4 1100 0129 9012 21f0 1080 0003 0100 0000 9010 2000 b010 0008 81c7 e008 81e8 0000 033f ffff 8200 6390
0355660 9de3 8001 f027 a044 f227 a048 1100 0129 d002 20e8 9002 2001 1300 0129 d022 60e8 1500 00fc d402 a384 8090 000a 0280 0007
0355740 0100 0000 1100 00ff 9012 2189 d207 a048 4000 0346 0100 0000 1700 00ff 9612 e1a4 1900 0128 d623 23f8 da07 a044 da27 bffc
0356020 de07 bffc 2100 0128 de24 23fc e207 bffc 8090 0011 1280 0005 0100 0000 9010 3fff 1080 001e 0100 0000 d007 a048 d207 bffc
0356100 7fff f7ad 0100 0000 dc27 bff4 e407 bff4 8090 0012 1280 0005 0100 0000 9010 3fff 1080 0012 0100 0000 e607 bff4 e804 e004
0356160 e827 bff8 ea07 bff8 8090 0015 1280 0006 0100 0000 1100 00ff 9012 21c0 4000 0217 0100 0000 ec07 bff8 d005 a028 1080 0003
0356240 0100 0000 9010 2000 b010 0008 81c7 e008 81e8 0000 033f ffff 8200 6398 9de3 8001 f027 a044 f227 a048 1100 0129 d002 20e8
0356320 9002 2001 1300 0129 d022 60e8 1500 00fc d402 a384 8090 000a 0280 0006 0100 0000 1100 00ff 9012 21ee 4000 0304 0100 0000
0356400 d607 a044 8090 000b 1280 0005 0100 0000 9010 2000 1080 0024 0100 0000 9010 2014 d207 a048 4000 1a7b 0100 0000 d027 bffc
0356460 d807 bffc da07 a044 de03 4000 de23 0000 e007 bffc e207 a044 e404 4000 e604 a004 e624 2004 e807 bffc ea07 a044 ec05 6004
0356540 ee05 a004 b005 e02c f025 2008 f207 bffc f407 a044 f606 a004 f806 e004 fa07 2028 fa26 600c d007 bffc d207 a044 d44a 6012
0356620 d42a 2010 d007 bffc 1080 0003 0100 0000 9010 2000 b010 0008 81c7 e008 81e8 0000 033f ffff 8200 63a0 9de3 8001 f027 a044
0356700 1100 0129 d002 20e8 9002 2001 1300 0129 d022 60e8 1500 00fc d402 a384 8090 000a 0280 0006 0100 0000 1100 00ff 9012 21fb
0356760 4000 02c6 0100 0000 d607 a044 8090 000b 1280 0005 0100 0000 9010 2000 1080 0007 0100 0000 d807 a044 d003 200c 1080 0003
0357040 0100 0000 9010 2000 b010 0008 81c7 e008 81e8 0000 033f ffff 8200 6398 9de3 8001 f027 a044 f227 a048 f427 a04c 1100 0129
0357120 d002 20e8 9002 2001 1300 0129 d022 60e8 1500 00fc d402 a384 8090 000a 0280 0006 0100 0000 1100 00ff 9012 220a 4000 02a3
0357200 0100 0000 d607 a04c 8090 000b 1280 0007 0100 0000 d807 a048 da03 2004 da27 bffc 1080 0007 0100 0000 d007 a048 d207 a04c
0357260 7fff f711 0100 0000 d027 bffc d207 bffc 8090 0009 1280 0006 0100 0000 1300 00ff 9212 621a 1080 0005 0100 0000 de07 bffc
0357340 d203 e004 9202 6008 d007 a044 4000 707b 0100 0000 d007 a044 1080 0003 0100 0000 9010 2000 b010 0008 81c7 e008 81e8 0000
0357420 033f ffff 8200 6398 9de3 8001 f027 a044 f227 a048 1100 0129 d002 20e8 9002 2001 1300 0129 d022 60e8 1500 00fc d402 a384
0357500 8090 000a 0280 0006 0100 0000 1100 00ff 9012 2227 4000 026d 0100 0000 d607 a048 8090 000b 0280 000c 0100 0000 d807 a044
0357560 8090 000c 0280 0008 0100 0000 d007 a044 4000 706e 0100 0000 80a2 200c 0280 0005 0100 0000 9010 3fff 1080 0034 0100 0000
0357640 da07 a048 da27 bffc de07 bffc e04b e012 a210 0010 80a4 6077 0280 0005 0100 0000 9010 3fff 1080 0029 0100 0000 e407 a044
0357720 e427 bff8 e607 bff8 e84c c000 aa10 0014 8090 0015 0280 0016 0100 0000 ec07 bff8 ee4d 8000 b010 0017 80a6 2030 0680 0008
0360000 0100 0000 f207 bff8 f44e 4000 b610 001a 80a6 e039 0480 0005 0100 0000 9010 3fff 1080 0012 0100 0000 f807 bff8 b807 2001
0360060 f827 bff8 10bf ffe8 0100 0000 fa07 bffc d007 6004 d002 2004 9002 2008 d207 a044 4000 7022 0100 0000 9010 2000 1080 0003
0360140 0100 0000 9010 2000 b010 0008 81c7 e008 81e8 0000 033f ffff 8200 6390 9de3 8001 f027 a044 1100 0129 d002 20e8 9002 2001
0360220 1300 0129 d022 60e8 1500 00fc d402 a384 8090 000a 0280 0006 0100 0000 1100 00ff 9012 223a 4000 0215 0100 0000 d607 a044
0360300 d627 bffc 9810 2001 d827 bff8 da07 bffc d003 6030 9002 21fb 9210 21fc 4000 7044 0100 0000 de07 bff8 9e03 c008 de27 bff8
0360360 e007 bffc d04c 2079 8090 0008 0280 0006 0100 0000 e207 bffc d004 6064 1080 0004 0100 0000 e407 bffc d004 a034 9002 21fb
0360440 9210 21fc 4000 7032 0100 0000 e607 bff8 a604 c008 e627 bff8 d007 bffc 7fff f33c 0100 0000 e807 bffc ea05 2048 ea27 bff4
0360520 ec07 bff4 8090 0016 0280 0011 0100 0000 ee07 bff4 f005 e004 d006 2028 9002 21fb 9210 21fc 4000 701e 0100 0000 f207 bff8
0360600 b206 4008 f227 bff8 f407 bff4 f606 8000 f627 bff4 10bf ffef 0100 0000 f807 bffc d007 2050 fa07 bff8 9022 001d 912a 2009
0360660 1080 0003 0100 0000 9010 2000 b010 0008 81c7 e008 81e8 0000 033f ffff 8200 63a0 9de3 8001 f027 a044 1100 0129 d002 20e8
0360740 9002 2001 1300 0129 d022 60e8 1500 00fc d402 a384 8090 000a 0280 0007 0100 0000 1100 00ff 9012 2250 d207 a044 4000 01bf
0361020 0100 0000 1700 00fc d602 e3d4 8090 000b 0280 0009 0100 0000 1100 00ff 9012 2262 1300 00fc d202 63d4 d407 a044 4000 00ab
0361100 0100 0000 d807 a044 1b00 00fc d823 63d4 9e10 2001 2100 0129 de24 20d0 9010 2000 b010 0008 81c7 e008 81e8 0000 033f ffff
0361160 8200 6370 9de3 8001 f027 a044 f227 a048 f427 a04c d007 a044 d027 bffc 9027 a02c d207 a04c 4000 6f91 0100 0000 9027 a028
0361240 1300 00ff 9212 6291 4000 6f8c 0100 0000 9227 a02c 1500 0128 d222 a3f8 1700 0128 c022 e3fc d807 a048 1b00 00fc d823 63d8
0361320 de07 bffc 8090 000f 0280 0012 0100 0000 e007 bffc e24c 2012 a410 0011 80a4 a072 0280 0008 0100 0000 e607 bffc e84c e012
0361400 aa10 0014 80a5 6077 1280 0006 0100 0000 ec07 bffc ee05 8000 3100 0128 ee26 23fc f207 bffc 8090 0019 1280 0008 0100 0000
0361460 1100 00ff 9012 22a6 4000 006c 0100 0000 1080 0013 0100 0000 f407 bffc f64e a012 f807 a04c fa4f 0000 80a6 c01d 0280 0008
0361540 0100 0000 1100 00ff 9012 22c3 4000 005f 0100 0000 1080 0006 0100 0000 1100 00ff 9012 22de 4000 0059 0100 0000 9010 2000
0361620 b010 0008 81c7 e008 81e8 0000 033f ffff 8200 6398 9de3 8001 f027 a044 f227 a048 f427 a04c f627 a050 f827 a054 d007 a044
0361700 d24a 0000 9410 0009 80a2 a030 0680 0010 0100 0000 d607 a044 d84a c000 9a10 000c 80a3 6039 1480 000a 0100 0000 1100 00ff
0361760 9012 2313 d027 bffc 1300 00ff 9212 631d d227 bff8 1080 0008 0100 0000 1100 00ff 9012 2320 d027 bffc 1300 00ff 9212 6326
0362040 d227 bff8 1100 011e 9012 22c8 d207 bffc 4000 6f27 0100 0000 1100 011e 9012 22c8 d207 a044 d407 a048 d607 a04c d807 a050
0362120 da07 a054 4000 6f1e 0100 0000 1100 011e 9012 22c8 d207 bff8 4000 6f19 0100 0000 1500 00fc d402 a3d0 8090 000a 1280 0004
0362200 0100 0000 1080 0016 0100 0000 1100 00fc d002 23d0 d207 bffc 4000 6f0d 0100 0000 1100 00fc d002 23d0 d207 a044 d407 a048
0362260 d607 a04c d807 a050 da07 a054 4000 6f04 0100 0000 1100 00fc d002 23d0 d207 bff8 4000 6eff 0100 0000 9010 2000 b010 0008
0362340 81c7 e008 81e8 0000 033f ffff 8200 6398 9de3 8001 f027 a044 f227 a048 f427 a04c f627 a050 f827 a054 1100 00ff 9012 2328
```

```
0362420  1300 00ff 9212 6333 4000 6ee4 0100 0000 1300 00fc d022 63d0 1500 011e d402 a2b4 9422 a001 1700 011e d422 e2b4 8090 000a
0362500  0680 0004 0100 0000 1900 011e d803 22b8 9803 2001 1b00 011e d823 62b8 9e23 2001 a010 200a e02b c000 a210 0010 1080 0030
0362560  0100 0000 2500 011e e454 a2c4 a610 0012 808c e080 0280 0024 0100 0000 2900 011e e805 22b4 aa20 0014 2d00 011e ec05 a2c0
0362640  80a5 4016 1680 001c 0100 0000 2f00 011e ee05 e2b8 a210 200a e22d c000 80a4 600a 0280 000b 0100 0000 3100 011e f006 22b8
0362720  b006 2001 3300 011e f026 62b8 b426 2001 e20e 8000 1080 000a 0100 0000 3700 011e f606 e2b8 d00e c000 1300 011e 9212 62b4
0363000  4000 6ee9 0100 0000 a210 0008 1080 0008 0100 0000 9010 200a 1300 011e 9212 62b4 4000 6ee1 0100 0000 a210 0008 1100 00ff
0363060  9012 2335 1300 0128 d202 63f8 7fff ff58 0100 0000 3900 0128 f807 23fc 8090 001c 1280 0008 0100 0000 1100 00ff 9012 2361
0363140  7fff ff4f 0100 0000 1080 0020 0100 0000 1100 0128 d002 23fc d002 2004 1300 0128 d202 63fc d402 600c 1700 0128 d602 e3fc
0363220  d602 e008 1300 00ff 9212 6384 7fff e3be 0100 0000 d027 bffc d807 bffc d203 2004 8090 0009 1280 0007 0100 0000 1b00 0128
0363300  da03 63fc d203 6004 1080 0004 0100 0000 de07 bffc d203 e004 1100 00ff 9012 2386 7fff ff2f 0100 0000 e007 a044 e24c 0000
0363360  e22f bffb 2500 0128 e404 a3fc 8090 0012 0280 0007 0100 0000 e64f bffb a810 0013 80a5 2032 0480 0008 0100 0000 1100 00ff
0363440  9012 23a4 7fff ff1e 0100 0000 1080 001d 0100 0000 d04f bffb 9210 0008 80a2 6031 1280 0010 0100 0000 1100 00ff 9012 23b4
0363520  7fff ff13 0100 0000 1100 00ff 9012 23dc 7fff ff0f 0100 0000 1100 0100 9012 2004 7fff ff0b 0100 0000 1080 000a 0100 0000
0363600  1100 0100 9012 202d 7fff ff05 0100 0000 1100 0100 9012 2059 7fff ff01 0100 0000 1100 0100 9012 2082 1300 00fc 9212 6390
0363660  7fff fefb 0100 0000 1100 0100 9012 2089 1300 00fc 9212 63a8 7fff fef5 0100 0000 1100 0100 9012 2090 7fff fef1 0100 0000
0363740  d04f bffb 9210 0008 80a2 6033 1280 0006 0100 0000 1100 0100 9012 20b0 7fff fee8 0100 0000 1500 00fc d402 a3d8 8090 000a
0364020  0280 0008 0100 0000 1100 0100 9012 20e3 1300 00fc d202 63d8 7fff fedd 0100 0000 1700 00fc d602 e3dc 8090 000b 0280 0008
0364100  0100 0000 1100 0100 9012 2112 1300 00fc d202 63dc 7fff fed2 0100 0000 1100 0100 9012 2132 1300 0129 d202 60e8 7fff fecc
0364160  0100 0000 d007 a044 d207 a048 d407 a04c d607 a050 d807 a054 7fff fec5 0100 0000 1900 00fc d803 23d0 8090 000c 1280 000a
0364240  0100 0000 1100 011e 9012 22c8 1300 0100 9212 6163 4000 6e06 0100 0000 1080 000c 0100 0000 1100 00fc d002 23d0 4000 6e27
0364320  0100 0000 1100 011e 9012 22c8 1300 0100 9212 6197 4000 6dfa 0100 0000 9010 2018 4000 6ddf 0100 0000 9010 2000 b010 0008
0364400  81c7 e008 81e8 0000 033f ffff 8200 63a0 9de3 8001 f027 a044 f227 a048 f427 a04c f627 a050 f827 a054 1100 0129 d002 20e8
0364460  1300 00fc d202 6384 80a2 0009 1680 0004 0100 0000 1080 004f 0100 0000 1100 0100 9012 21cc 4000 6e02 0100 0000 d007 a044
0364540  d207 a048 d407 a04c d607 a050 d807 a054 4000 6dfb 0100 0000 1500 011e d402 a2b4 9422 a001 1700 011e d422 e2b4 8090 000a
0364620  0680 0004 0100 0000 1900 011e d803 22b8 9803 2001 1b00 011e d823 62b8 9e23 2001 a010 200a e02b c000 a210 0010 1080 0030
0364700  0100 0000 2500 011e e454 a2c4 a610 0012 808c e080 0280 0024 0100 0000 2900 011e e805 22b4 aa20 0014 2d00 011e ec05 a2c0
0364760  80a5 4016 1680 001c 0100 0000 2f00 011e ee05 e2b8 a210 200a e22d c000 80a4 600a 0280 000b 0100 0000 3100 011e f006 22b8
0365040  b006 2001 3300 011e f026 62b8 b426 2001 e20e 8000 1080 000a 0100 0000 3700 011e f606 e2b8 d00e c000 1300 011e 9212 62b4
0365120  4000 6dd5 0100 0000 a210 0008 1080 0008 0100 0000 9010 200a 1300 011e 9212 62b4 4000 6dcd 0100 0000 a210 0008 9010 2000
0365200  b010 0008 81c7 e008 81e8 0000 033f ffff 8200 6330 9de3 8001 f027 a044 9427 a064 1300 0100 9212 61db d007 a044 4000 6dfa
0365260  0100 0000 80a2 2001 0280 0005 0100 0000 9010 2000 1080 0051 0100 0000 9027 a064 4000 6d9a 0100 0000 9002 2001 1300 0129
0365340  d202 60dc 4000 170b 0100 0000 d027 bf98 9227 a064 d007 bf98 4000 6d78 0100 0000 c027 bf94 d007 bf98 d207 bf94 d44a 0009
0365420  9610 000a 8090 000b 0280 0038 0100 0000 d007 bf98 d207 bf94 d44a 0009 9610 000a d627 bf90 d807 bf90 80a3 2041 0680 0006
0365500  0100 0000 da07 bf90 80a3 604b 0480 000a 0100 0000 de07 bf90 80a3 e061 0680 000d 0100 0000 e007 bf90 80a4 206b 1480 0009
0365560  0100 0000 1100 0129 d002 20ec 9002 2031 1300 0129 d022 60ec 1080 0017 0100 0000 d407 bf90 80a2 a04c 0680 0006 0100 0000
0365640  d607 bf90 80a2 e05a 0480 000a 0100 0000 d807 bf90 80a3 206c 0680 000b 0100 0000 da07 bf90 80a3 607a 1480 0007 0100 0000
0365720  1100 0129 d002 20ec 9002 201f 1300 0129 d022 60ec d407 bf94 9402 a001 d427 bf94 10bf ffc5 0100 0000 d007 bf98 1080 0003
0366000  0100 0000 9010 2000 b010 0008 81c7 e008 81e8 0000 033f ffff 8200 6390 9de3 8001 9010 2001 1300 0129 d022 60c8 1100 0100
0366060  9012 21de 1300 0100 9212 61eb 4000 6d1b 0100 0000 d027 bffc d407 bffc 8090 000a 1280 0004 0100 0000 1080 00a8 0100 0000
0366140  c02f bff4 9610 2001 1900 0129 d623 20cc 9a10 2066 da2f bff0 9010 2400 4000 1651 0100 0000 1f00 0129 d023 e0dc a010 206d
0366220  e02f bff3 a210 207a 2500 0129 e224 a0ec a610 206f e62f bff1 1100 0100 9012 21ed 4000 6d2b 0100 0000 a810 2061 e82f bff2
0366300  1100 0100 9012 2204 4000 6d76 0100 0000 9227 a010 4000 6d13 0100 0000 8090 0008 0280 0009 0100 0000 1100 0100 9012 2205
0366360  4000 6d1b 0100 0000 9010 2008 4000 6cdc 0100 0000 d007 bffc 7fff ff61 0100 0000 d027 bff8 d007 bff8 8090 0008 0280 0067
0366440  0100 0000 d007 bff8 7fff ab8e 0100 0000 d007 bff8 1300 0100 9212 620c 4000 6cf9 0100 0000 8090 0008 1280 000b 0100 0000
0366520  d007 bffc 7fff ff4e 0100 0000 4000 6cfa 0100 0000 1300 00fc d022 6384 1080 004d 0100 0000 d007 bff8 1300 0100 9212 6212
0366600  4000 6ce8 0100 0000 8090 0008 1280 000c 0100 0000 d007 bffc 7fff ff31 0100 0000 1300 00fc d022 63d4 9410 2001 1700 0129
0366660  d422 e0d0 1080 003b 0100 0000 d007 bff8 1300 0100 9212 6217 4000 6cd6 0100 0000 8090 0008 1280 001c 0100 0000 d007 bffc
0366740  7fff ff2b 0100 0000 1300 00fc d022 63d4 9410 2001 1700 0129 d422 e0d4 1100 0100 9012 221d 1300 0100 9212 622d 4000 6ca7
0367020  0100 0000 1900 0124 d023 226c 1100 0100 9012 222f 1300 0100 9212 623d 4000 6c9f 0100 0000 1b00 0124 d023 6264 1080 0019
0367100  0100 0000 d007 bff8 1300 0100 9212 623f 4000 6cb4 0100 0000 8090 0008 1280 0007 0100 0000 9010 2001 1300 0129 d022 60d8
0367160  1080 000c 0100 0000 d007 bff8 4000 6cb2 0100 0000 1300 0129 d202 60ec 9222 4008 1500 0129 d222 a0ec 1080 0008 0100 0000
0367240  d007 bffc 7fff fefa 0100 0000 d027 bff8 10bf ff99 0100 0000 1700 0129 d602 e0ec 8090 000b 0280 0009 0100 0000 1100 0100
0367320  9012 2247 4000 6ca2 0100 0000 9010 2008 4000 6c63 0100 0000 d007 bffc 4000 6c9f 0100 0000 9010 2000 b010 0008 81c7 e008
0367400  81e8 0000 0000 0000 033f ffff 8200 63c0 9de3 8001 f027 a044 f227 a048 f427 a04c d007 a04c d24a 0000 9410 0009 8090 000a
0367460  0280 0014 0100 0000 d607 a04c d84a c000 9a10 000c 9e0b 60ff e007 a044 e207 a048 a52c 6018 a53c a018 e64c 000f a614 c012
```

```
0367540  a72c e018 a73c e018 e62c 000f e807 a04c a805 2001 e827 a04c 10bf ffea 0100 0000 9010 2000 b010 0008 81c7 e008 81e8 0000
0367620  033f ffff 8200 63b8 9de3 8001 f027 a044 f227 a048 d007 a044 9202 2154 d227 bffc d407 a048 d64a 8000 9810 000b 8090 000c
0367700  0280 0021 0100 0000 d007 a048 d24a 0000 d22f bffb d44f bffb 9610 000a 980a e0ff da07 bffc c02b 400c de4f bffb a010 000f
0367760  80a4 200a 1280 0008 0100 0000 e24f bffb a410 0011 a60c a0ff e807 bffc aa10 2010 ea2d 0013 ec4f bffb ae10 0016 80a5 e05c
0370040  1280 0004 0100 0000 f007 a044 c02e 212b f207 a048 b206 6001 f227 a048 10bf ffdd 0100 0000 9010 2000 b010 0008 81c7 e008
0370120  81e8 0000 033f ffff 8200 63a0 9de3 8001 f027 a044 1100 0100 9012 23b0 d207 a044 4000 6c3b 0100 0000 9010 200c 4000 6bfc
0370200  0100 0000 9010 2000 b010 0008 81c7 e008 81e8 0000 033f ffff 8200 6398 9de3 8001 f027 a044 d007 a044 d202 2130 9010 2200
0370260  4000 1598 0100 0000 d027 bff8 d207 a044 d407 bff8 d422 6138 9610 2100 d627 bffc d807 bffc 8090 000c 0480 000e 0100 0000
0370340  da07 a044 de53 6120 e007 bff8 de34 0000 e207 bff8 a204 6002 e227 bff8 e407 bffc a424 a001 e427 bffc 10bf fff2 0100 0000
0370420  9010 2000 b010 0008 81c7 e008 81e8 0000 033f ffff 8200 6390 9de3 8001 f027 a044 f227 a048 f427 a04c f627 a050 f827 a054
0370500  fa27 a058 9010 2458 d207 a044 4000 1571 0100 0000 d027 bffc d007 bffc 130c 24e0 9212 6124 d222 2114 d407 bffc c022 a10c
0370560  9010 2004 d207 a044 4000 1566 0100 0000 d607 bffc d022 e104 d807 bffc da03 2104 9e10 2001 de23 4000 e007 bffc c024 211c
0370640  e207 bffc a410 2001 e42c 612a e607 bffc a810 2001 e82c e12b ea07 bffc c02d 612c ec07 bffc c02d a12d ee07 bffc b010 2001
0370720  f02d e12e f207 bffc c026 6110 f407 bffc f607 a044 f626 a130 f807 bffc fa07 a04c fa37 2120 d007 bffc d207 a050 d232 2122
0371000  d407 bffc d607 a054 d632 a124 d807 bffc da07 a058 da33 2126 de07 bffc e007 a05c e033 e128 e207 bffc c024 6134 e407 bffc
0371060  c024 a140 e607 bffc 2900 00f0 a815 215c e824 e144 ea07 bffc c025 6138 ec07 bffc c025 a14c ee07 bffc f007 bffc b206 2255
0371140  f225 e108 f407 bffc c026 a118 b610 2104 f627 bff8 f807 bffc ba07 2150 fa27 bff4 d007 bff8 8090 0008 0480 000c 0100 0000
0371220  d207 bff4 c02a 4000 d407 bff4 9402 a001 d427 bff4 d607 bff8 9622 e001 d627 bff8 10bf fff4 0100 0000 d007 bffc 9002 2154
0371300  9210 2005 1500 0100 9412 a3e3 7fff ff0f 0100 0000 d007 bffc 9002 2154 9210 2005 1500 0100 9412 a3ff 7fff ff08 0100 0000
0371360  d007 bffc 9002 2154 9210 2004 1500 0101 9412 a01a 7fff ff01 0100 0000 d007 bffc 9002 2154 9210 2002 1500 0101 9412 a025
0371440  7fff fefa 0100 0000 d807 bffc 9a10 3f81 da2b 2153 d007 bffc 9002 2154 9210 2020 1500 0101 9412 a02b 7fff fef0 0100 0000
0371520  d007 bffc 9002 2154 9210 2020 1500 0101 9412 a047 7fff fee9 0100 0000 d007 bffc 9002 2154 9210 2020 1500 0101 9412 a062
0371600  7fff fee2 0100 0000 d007 bffc 9002 2154 9210 2010 1500 0101 9412 a06d 7fff fedb 0100 0000 d007 bffc 9002 2154 9210 2040
0371660  1500 0101 9412 a071 7fff fed4 0100 0000 de07 a048 8090 000f 0280 0006 0100 0000 d007 bffc d207 a048 7fff feee 0100 0000
0371740  d007 bffc 1080 0003 0100 0000 9010 2000 b010 0008 81c7 e008 81e8 0000 033f ffff 8200 6390 9de3 8001 f027 a044 f227 a048
0372020  f427 a04c d007 a044 d027 bffc d207 bffc 8090 0009 0280 0009 0100 0000 d407 bffc d602 a114 190c 24e0 9813 2124 80a2 c00c
0372100  0280 0006 0100 0000 1100 0101 9012 2076 7fff ff01 0100 0000 da07 bffc 9e03 6154 de27 bff8 e007 a04c e24c 0000 a410 0011
0372160  8090 0012 0280 0023 0100 0000 d007 a04c d24a 0000 9410 0009 960a a0ff d807 bff8 9a03 000b da27 bff4 de07 a04c 9e03 e001
0372240  de27 a04c e007 a048 80a4 2002 0280 0009 0100 0000 e207 bff4 e44c 4000 a610 0012 a80c fff0 aa15 2005 ec07 bff4 ea2d 8000
0372320  ee07 a048 80a5 e001 0280 0008 0100 0000 f007 bff4 f24e 0000 b216 6020 b32e 6018 b33e 6018 f22e 0000 10bf ffdb 0100 0000
0372400  9010 2000 b010 0008 81c7 e008 81e8 0000 033f ffff 8200 6398 9de3 8001 f027 a044 d007 a044 d027 bffc d207 bffc 8090 0009
0372460  0280 0009 0100 0000 d407 bffc d602 a114 190c 24e0 9813 2124 80a2 c00c 0280 0006 0100 0000 1100 0101 9012 2080 7fff febe
0372540  0100 0000 da07 bffc 9e10 2001 de2b 612d 9010 2000 b010 0008 81c7 e008 81e8 0000 033f ffff 8200 6398 9de3 8001 f027 a044
0372620  d007 a044 d027 bffc d207 bffc 8090 0009 0280 0009 0100 0000 d407 bffc d602 a114 190c 24e0 9813 2124 80a2 c00c 0280 0006
0372700  0100 0000 1100 0101 9012 208f 7fff fea2 0100 0000 da07 bffc c02b 612e 9010 2000 b010 0008 81c7 e008 81e8 0000 033f ffff
0372760  8200 6398 9de3 8001 f027 a044 d007 a044 d027 bffc d207 bffc 8090 0009 0280 0009 0100 0000 d407 bffc d602 a114 190c 24e0
0373040  9813 2124 80a2 c00c 0280 0006 0100 0000 1100 0101 9012 2099 7fff fe87 0100 0000 da07 bffc 9e10 2044 de2b 617f e007 bffc
0373120  a210 2044 e22c 2181 9010 2000 b010 0008 81c7 e008 81e8 0000 033f ffff 8200 6398 9de3 8001 f027 a044 f227 a048 d007 a044
0373200  d027 bffc d207 bffc 8090 0009 0280 0009 0100 0000 d407 bffc d602 a114 190c 24e0 9813 2124 80a2 c00c 0280 0006 0100 0000
0373260  1100 0101 9012 20a2 7fff fe67 0100 0000 da07 bffc de07 a048 de23 6140 9010 2000 b010 0008 81c7 e008 81e8 0000 033f ffff
0373340  8200 6398 9de3 8001 f027 a044 f227 a048 d007 a044 d027 bffc d207 bffc 8090 0009 0280 0009 0100 0000 d407 bffc d602 a114
0373420  190c 24e0 9813 2124 80a2 c00c 0280 0006 0100 0000 1100 0101 9012 20ae 7fff fe4a 0100 0000 da07 bffc de07 a048 de23 6144
0373500  9010 2000 b010 0008 81c7 e008 81e8 0000 033f ffff 8200 6398 9de3 8001 f027 a044 f227 a048 f427 a04c d007 a044 d027 bffc
0373560  d207 bffc 8090 0009 0280 0009 0100 0000 d407 bffc d602 a114 190c 24e0 9813 2124 80a2 c00c 0280 0006 0100 0000 1100 0101
0373640  9012 20b9 7fff fe2c 0100 0000 da07 a048 de4b 4000 de2f bffb e007 bffc a204 2154 e44f bffb a610 0012 a80c e0ff aa10 2006
0373720  ea2c 4014 ec07 bffc ee05 a138 8090 0017 1280 0005 0100 0000 d007 bffc 7fff fe2a 0100 0000 f007 bffc f206 2138 f44f bffb
0374000  b610 001a b80e e0ff bb2f 2001 d007 a04c d036 401d 9010 2000 b010 0008 81c7 e008 81e8 0000 033f ffff 8200 6380 9de3 8001
0374060  f027 a044 f227 a048 f427 a04c d007 a044 d027 bffc d207 bffc 8090 0009 0280 0009 0100 0000 d407 bffc d602 a114 190c 24e0
0374140  9813 2124 80a2 c00c 0280 0006 0100 0000 1100 0101 9012 20c2 7fff fdf7 0100 0000 da07 a04c 1f3f fff6 9e13 e0f1 80a3 400f
0374220  0680 0008 0100 0000 e007 a04c 2300 001d a214 6130 80a4 0011 0480 000b 0100 0000 1100 0101 9012 20cb d207 a04c d407 a048
0374300  4000 6a27 0100 0000 9010 200c 4000 69e8 0100 0000 d007 a048 d24a 0000 9410 0009 960a a0ff d627 bfec d807 bfec 8090 000c
0374360  1280 0004 0100 0000 1080 009c 0100 0000 da07 bffc 9e03 6154 de27 bff4 e007 bff4 e207 bfec e44c 0011 a610 0012 a80c e00f
0374440  e827 bfe8 c027 bfe4 ea07 bfe8 80a5 6005 1280 0007 0100 0000 ec07 bffc ae10 2001 ee2d a12c 1080 0006 0100 0000 d007 a048
0374520  4000 69fa 0100 0000 d027 bfe4 f007 bfe4 80a6 2001 0280 002a 0100 0000 d007 bffc d202 2134 8090 0009 1280 000c 0100 0000
0374600  d007 bffc 9002 2134 d407 bffc d602 a130 1300 0100 9212 63a0 9410 2003 9810 2001 7fff e1e9 0100 0000 d607 bffc d202 e134
```

```
0374660 d007 a04c d407 a048 9610 2000 7fff e1f5 0100 0000 8090 0008 1280 000f 0100 0000 d007 bffc d002 2134 d207 a048 9410 2000
0374740 7fff e212 0100 0000 d207 bffc d202 6134 d007 a04c d407 a048 9610 2000 7fff e1e5 0100 0000 1080 001b 0100 0000 d007 bffc
0375020 d202 2138 8090 0009 1280 0005 0100 0000 d007 bffc 7fff fd9c 0100 000c d407 bffc d602 a138 d807 bfec 9b2b 2001 de07 a04c
0375100 de32 c00d e007 bfe8 80a4 2003 0280 0009 0100 0000 e207 bff4 e407 bfec e64c 4012 a60c fff0 a72c e018 a73c e018 e62c 4012
0375160 e807 bfe4 80a5 2001 0480 003b 0100 0000 d007 a048 d027 bff0 d207 bff0 d44a 4000 9610 000a 8090 000b 0280 002a 0100 0000
0375240 d007 bff0 d24a 0000 9410 0009 960a a0ff d807 bff4 9a03 000b da27 bff8 de07 bff0 9e03 e001 de27 bff0 e007 bff8 e24c 0000
0375320 a410 0011 a60c a00f 80a4 e003 0280 0017 0100 0000 d007 bff8 d24a 0000 9410 0009 808a a00f 0280 000a 0100 0000 1100 0101
0375400 9012 20fc d207 a048 4000 6995 0100 0000 9010 200c 4000 6956 0100 0000 d007 bff8 d24a 0000 9410 0009 960a bff0 9812 e003
0375460 da07 bff8 d82b 4000 10bf ffd4 0100 0000 de07 bffc e003 e110 e207 bfe4 80a4 4010 0480 0005 0100 0000 e407 bffc e607 bfe4
0375540 e624 a110 9010 2000 b010 0008 81c7 e008 81e8 0000 033f ffff 8200 6398 9de3 8001 f027 a044 f227 a048 f427 a04c d007 a044
0375620 d027 bffc d207 bffc 8090 0009 0280 0009 0100 0000 d407 bffc d602 a114 190c 24e0 9813 2124 80a2 c00c 0280 0006 0100 0000
0375700 1100 0101 9012 211a 7fff fd23 0100 0000 da07 a04c 9a23 6001 da27 a04c de07 a048 e003 c000 8090 0010 0280 001e 0100 0000
0375760 d007 a048 d202 0000 d227 bff8 d407 a048 9402 a004 d427 a048 d607 bff8 d84a c000 9a10 000c 80a3 6020 1280 0008 0100 0000
0376040 d007 bff8 9002 2001 d027 bff8 d207 a04c 9222 6001 d227 a04c d407 a04c 9402 a001 d427 a04c d007 a044 d207 bff8 d407 a04c
0376120 7fff fef5 0100 0000 10bf ffe1 0100 0000 9010 2000 b010 0008 81c7 e008 81e8 0000 033f ffff 8200 6398 9de3 8001 f027 a044
0376200 f227 a048 d007 a044 d027 bffc d207 bffc 8090 0009 0280 0009 0100 0000 d407 bffc d602 a114 190c 24e0 9813 2124 80a2 c00c
0376260 0280 0006 0100 0000 1100 0101 9012 2124 7fff fce5 0100 0000 da07 bffc 9e03 6154 e007 a048 e24c 0000 a410 0011 a60c a0ff
0376340 e84b c013 aa10 0014 ac0d 600f 80a5 a005 0280 001b 0100 0000 d007 a048 4000 690f 0100 0000 80a2 2001 1280 0015 0100 0000
0376420 d007 bffc d202 2138 8090 0009 1280 0006 0100 0000 1100 0013 9012 2220 1080 0023 0100 0000 d407 bffc d602 a138 d807 a048
0376500 da4b 0000 9e10 000d a00b e0ff a32c 2001 d052 c011 1080 0019 0100 0000 e407 bffc e604 a134 8090 0013 0280 000c 0100 0000
0376560 9027 a008 e807 bffc d205 2134 d407 a048 9610 2000 7fff e116 0100 0000 8090 0008 1280 0006 0100 0000 1100 0013 9012 2220
0376640 1080 0006 0100 0000 d007 bff8 1080 0003 0100 0000 9010 2000 b010 0008 81c7 e008 81e8 0000 033f ffff 8200 6398 9de3 8001
0376720 f027 a044 f227 a048 f427 a04c d007 a044 d027 bffc d207 bffc 8090 0009 0280 0009 0100 0000 d407 bffc d602 a114 190c 24e0
0377000 9813 2124 80a2 c00c 0280 0006 0100 0000 1100 0101 9012 212f 7fff fc8f 0100 0000 da07 bffc c02b 612a de07 bffc e007 a048
0377060 e023 e13c e207 bffc e407 a04c e424 6148 e607 bffc c024 e10c 9010 2000 b010 0008 81c7 e008 81e8 0000 033f ffff 8200 63c0
0377140 9de3 8001 f027 a044 d007 a044 d202 2104 d402 4000 9402 a001 d422 4000 d607 a044 9802 e255 da07 a044 de03 6108 a023 c00c
0377220 e207 a044 e404 6118 a604 8010 e807 a044 e625 211c 9010 2000 b010 0008 81c7 e008 81e8 0000 033f ffff 8200 63a0 9de3 8001
0377300 f027 a044 d007 a044 d24a 212a 8090 0009 0280 0005 0100 0000 9010 3fff 1080 0032 0100 0000 d407 a044 9602 a255 d807 a044
0377360 da03 2108 9e23 400b e007 a044 e204 2118 a204 400f e224 2118 e407 a044 e607 a044 a804 e255 e824 a108 ea07 a044 c205 613c
0377440 ec07 a044 d005 a108 d207 a044 9202 6148 9fc0 4000 0100 0000 ee07 a044 d025 e10c f007 a044 f206 210c b226 6001 f226 210c
0377520 8090 0019 0680 000b 0100 0000 f407 a044 f606 a108 b606 e001 f626 a108 b826 e001 d04f 0000 900a 20ff 1080 000b 0100 0000
0377600 fa07 a044 c027 610c d007 a044 9210 2001 d22a 212a 9010 3fff 1080 0003 0100 0000 9010 2000 b010 0008 81c7 e008 81e8 0000
0377660 033f ffff 8200 63a0 9de3 8001 f027 a044 d007 a044 d202 210c 9222 6001 d222 210c 8090 0009 1680 0007 0100 0000 d007 a044
0377740 7fff ffb5 0100 0000 1080 0009 0100 0000 d407 a044 d602 a108 9602 e001 d622 a108 9822 e001 d04b 0000 900a 20ff 1080 0003
0400020 0100 0000 9010 2000 b010 0008 81c7 e008 81e8 0000 033f ffff 8200 63c0 9de3 8001 f027 a044 f227 a048 d007 a048 80a2 3fff
0400100 1280 0004 0100 0000 1080 000d 0100 0000 d207 a044 d402 610c 9402 a001 d422 610c d607 a044 d802 e108 9823 2001 d822 e108
0400160 da07 a048 da2b 0000 9010 2000 b010 0008 81c7 e008 81e8 0000 033f ffff 8200 6390 9de3 8001 f027 a044 f227 a048 d007 a048
0400240 9022 2001 d027 a048 d207 a044 d402 610c d607 a048 80a2 800b 1480 005d 0100 0000 d007 a044 d24a 212a 8090 0009 1280 0006
0400320 0100 0000 d407 a048 80a2 a100 0580 0005 0100 0000 9010 3fff 1080 0059 0100 0000 d607 a044 9802 e254 da07 a044 de03 6108
0400400 a023 c00c e207 a044 e404 610c a604 0012 80a4 e100 0480 0029 0100 0000 d007 a044 d202 2108 d227 bff0 d407 a044 9602 a255
0400460 d627 bff4 d807 a044 da07 a044 de03 6108 e007 bff4 a223 c010 e403 2118 a404 8011 e423 2118 e607 a044 e807 bff4 e824 e108
0400540 ea07 a044 ec05 610c ec27 bff8 ee07 bff8 8090 0017 0480 0011 0100 0000 f007 bff4 f207 bff0 f44e 4000 f42e 0000 f607 bff0
0400620 b606 e001 f627 bff0 f807 bff4 b807 2001 f827 bff4 fa07 bff8 ba27 6001 fa27 bff8 10bf ffef 0100 0000 d007 a044 c202 213c
0400700 d207 a044 d402 610c d607 a044 d002 e108 9002 000a d207 a044 9202 6148 9fc0 4000 0100 0000 d027 bffc d807 bffc 8090 000c
0400760 1480 0008 0100 0000 d007 a044 9210 2001 d22a 212a 9010 3fff 1080 0011 0100 0000 d407 a044 d607 bffc d802 a10c 9803 000b
0401040 d822 a10c 10bf ffa1 0100 0000 da07 a044 de03 6108 e007 a048 d04b c010 900a 20ff 1080 0003 0100 0000 9010 2000 b010 0008
0401120 81c7 e008 81e8 0000 033f ffff 8200 6390 9de3 8001 f027 a044 d007 a044 d202 2104 d402 4000 d427 bff8 c027 bff4 9610 202f
0401200 d627 bff0 d007 a044 d202 210c 9222 6001 d222 210c 8090 0009 1680 0007 0100 0000 d007 a044 7fff ff04 0100 0000 1080 0009
0401260 0100 0000 d407 a044 d602 a108 9602 e001 d622 a108 9822 e001 d04b 0000 900a 20ff d027 bffc da07 bffc 80a3 602a 1280 000b
0401340 0100 0000 d007 bff0 80a2 202f 1280 0005 0100 0000 d207 bff4 9202 6001 d227 bff4 1080 002b 0100 0000 d407 bffc 80a2 a02f
0401420 1280 0013 0100 0000 d007 bff0 80a2 202a 1280 000d 0100 0000 d207 a044 d44a 612e 8090 000a 0280 0007 0100 0000 d607 bff4
0401500 9622 e001 d627 bff4 1080 0003 0100 0000 c027 bff4 1080 0016 0100 0000 d807 bffc 80a3 3fff 1280 000b 0100 0000 d007 a044
0401560 c202 2144 1100 0101 9012 2137 d207 bff8 9fc0 4000 0100 0000 1080 0010 0100 0000 d007 bffc 80a2 200a 1280 0005 0100 0000
0401640 d007 a044 7fff fead 0100 0000 d207 bffc 1227 bff0 d407 bff4 8090 000a 14bf ffb2 0100 0000 9010 2000 b010 0008 81c7 e008
0401720 81e8 0000 033f ffff 8200 6390 9de3 8001 f027 a044 d007 a044 d24a 212b 8090 0009 1280 0005 0100 0000 9010 205c 1080 00b1
```

```
0402000  0100 0000 d007 a044 7fff feea 0100 0000 d027 bffc d007 bffc 80a2 2020 02bf fffa 0100 0000 d207 bffc d227 bff8 1080 003e
0402060  0100 0000 d007 a044 7fff fe88 0100 0000 9010 3ffe d027 bff8 1080 009a 0100 0000 9210 200a d227 bff8 1080 0096 0100 0000
0402140  9410 2009 d427 bff8 1080 0092 0100 0000 9610 200d d627 bff8 1080 008e 0100 0000 9810 2008 d827 bff8 1080 008a 0100 0000
0402220  9a10 200c da27 bff8 1080 0086 0100 0000 9e10 2002 de27 bff4 c027 bff8 d007 bffc 9222 2030 d407 bff8 972a a003 9802 c009
0402300  d827 bff8 d007 a044 7fff feba 0100 0000 d027 bffc da07 bff4 9a23 6001 da27 bff4 8090 000d 0680 000a 0100 0000 de07 bffc
0402360  80a3 e030 0680 c006 0100 0000 e007 bffc 80a4 2037 04bf ffea 0100 0000 d007 a044 d207 bffc 7fff fec4 0100 0000 1080 0065
0402440  0100 0000 d007 bffc 9022 200a 80a2 206a 1880 0060 1500 0089 9412 a1b0 9332 2005 a210 0009 a32c 6002 9202 4011 a32c 6001
0402520  9202 4011 9202 4008 a410 201f 920a 4012 992a 6003 d603 000a 80a2 c008 0280 000d 0100 0000 80a2 ffff 0280 004e 0100 0000
0402600  9803 2008 980b 20f8 d603 000a 80a2 c008 0280 c004 c100 0000 10bf fff7 0100 0000 9803 000a d003 2004 81c2 0000 0100 0000
0402660  0000 0000 0002 2434 ffff ffff 0002 26b0 0000 0048 0002 2470 ffff ffff 0002 26b0 0000 004a 0002 2460 0000 0038 0002 2480
0402740  ffff ffff 0002 26b0 ffff ffff 0002 26b0 ffff ffff 0002 26b0 0000 003c 0002 2490 ffff ffff 0002 26b0 0000 0064 0002 2450
0403020  ffff ffff 0002 26b0 ffff ffff 0002 26b0 ffff ffff 0002 26b0 0000 0068 0002 2470 ffff ffff 0002 26b0 0000 006a 0002 2460
0403100  0000 0058 0002 2480 0000 0026 0002 24a0 0000 0027 0002 24a0 0000 0028 0002 24a0 0000 0029 0002 24a0 0000 002a 0002 24a0
0403160  0000 002b 0002 24a0 0000 002c 0002 24a0 0000 002d 0002 24a0 0000 005c 0002 2490 ffff ffff 0002 26b0 ffff ffff 0002 26b0
0403240  0000 0044 0002 2450 ffff ffff 0002 26b0 d007 bff8 1080 0003 0100 0000 9010 2000 b010 0008 81c7 e008 81e8 0000 033f ffff
0403320  8200 6390 9de3 8001 f027 a044 f22f a04b 9010 2100 d027 bff8 d207 a044 d227 bff4 d007 a044 d202 210c 9222 6001 d222 210c
0403400  8090 0009 1680 0007 0100 0000 d007 a044 7fff fde9 0100 0000 1080 0009 0100 0000 d407 a044 d602 a108 9602 e001 d622 a108
0403460  9822 e001 d04b 0000 900a 20ff d027 bffc da4f a04b 9e10 000d e007 bffc 80a4 000f 1280 0004 0100 0000 1080 0042 0100 0000
0403540  e207 bffc 80a4 600a 0280 0006 0100 0000 e407 bffc 80a4 bfff 1280 0014 0100 0000 d007 a044 c202 2144 d207 a044 d402 6104
0403620  d202 8000 1100 0101 9012 2162 9fc0 4000 0100 0000 d607 bffc 80a2 e00a 1280 0005 0100 0000 d007 a044 7fff fda8 0100 0000
0403700  1080 0028 0100 0000 d807 bff4 da07 bffc da2b 0000 de07 bff4 9e03 e001 de27 bff4 e007 bffc 80a4 205c 1280 0018 0100 0000
0403760  d007 bff4 9022 2001 d027 bff4 d007 a044 7fff fef5 0100 0000 d027 bffc d207 bffc 8090 0009 1680 0007 0100 0000 d407 bff8
0404040  9402 a001 d427 bff8 1080 0008 0100 0000 d607 bff4 d807 bffc d92a c000 da07 bff4 9a03 6001 da27 bff4 de07 bff8 9e23 e001
0404120  de27 bff8 8090 000f 14bf ffa6 0100 0000 e007 bff8 8090 0010 1480 000b 0100 0000 e207 a044 c204 6144 e407 a044 e604 a104
0404200  d204 c000 1100 0101 9012 2189 9fc0 4000 0100 0000 a810 2100 ea07 bff8 ac25 0015 2f00 0124 ec25 e270 1100 0124 d002 2270
0404260  1080 0003 0100 0000 9010 2000 b010 0008 81c7 e008 81e8 0000 033f ffff 8200 6398 9de3 8001 f027 a044 d007 a044 d027 bffc
0404340  d207 bffc 8090 0009 028c 0009 0100 0000 d407 bffc d602 a114 190c 24e0 9813 2124 80a2 c00c 0280 0006 0100 0000 1100 0101
0404420  9012 21aa 7fff f9d0 0100 0000 da07 bffc 9e03 6255 e007 bffc e204 2108 a424 400f e607 bffc d004 e118 9002 0012 e807 bffc
0404500  ea05 211c 9022 0015 1080 0003 0100 0000 9010 2000 b010 0008 81c7 e008 81e8 0000 033f ffff 8200 6398 9de3 8001 f027 a044
0404560  d007 a044 d027 bffc d207 bffc 8090 0009 0280 0009 0100 0000 d407 bffc d602 a114 190c 24e0 9813 2124 80a2 c00c 0280 0006
0404640  0100 0000 1100 0101 9012 21b3 7fff f9aa 0100 0000 da07 bffc 9e03 6255 e007 bffc e204 2108 a424 400f e607 bffc d004 e118
0404720  9002 0012 1080 0003 0100 0000 9010 2000 b010 0008 81c7 e008 81e8 0000 033f ffff 8200 6398 9de3 8001 f027 a044 f227 a048
0405000  d007 a044 d027 bffc d207 bffc 8090 0009 0280 0009 0100 0000 d407 bffc d602 a114 190c 24e0 9813 2124 80a2 c00c 0280 0006
0405060  0100 0000 1100 0101 9012 21bb 7fff f986 0100 0000 da07 bffc de07 a048 de23 6104 e007 a048 a210 2001 e224 0000 9010 2000
0405140  b010 0008 81c7 e008 81e8 0000 033f ffff 9200 6388 9de3 8001 f027 a044 f227 a048 f427 a04c f627 a050 d007 a050 d027 bfec
0405220  d207 bfec 8090 0009 0280 0009 0100 0000 d407 bfec d602 a114 190c 24e0 9813 2124 80a2 c00c 0280 0006 0100 0000 1100 0101
0405300  9012 21c6 7fff f964 0100 0000 da07 bfec 9e03 6154 de27 bff4 e007 a048 e24c 0000 a410 0011 80a4 a045 1280 0005 0100 0000
0405360  a610 2001 1080 0003 0100 0000 a610 2000 e627 bff0 e807 a048 a805 2001 e827 a048 ea07 a048 aa05 6001 ea27 a048 ac25 6001
0405440  ee4d 8000 b010 0017 80a6 2059 1280 0008 0100 0000 f207 bff4 f44e 4000 b416 bf80 b52e a018 b53e a018 f42e 4000 f607 a048
0405520  f627 bff8 f807 bff8 fa4f 0000 9010 001d 8090 0008 0280 0011 0100 0000 d207 bff8 d44a 4000 9610 000a 980a e0ff da07 bff4
0405600  de4b 400c 9e13 ff80 9f2b e018 9f3b e018 de2b 400c e007 bff8 a004 2001 e027 bff8 10bf ffed 0100 0000 e207 a044 e227 bff8
0405660  a410 3ffe 2700 0124 e424 e270 e807 a04c a825 2001 e827 a04c d007 bfec d202 210c 9222 6001 d222 210c 8090 0009 1680 0007
0405740  0100 0000 d007 bfec 7fff fcb3 0100 0000 1080 0009 0100 0000 d407 bfec d602 a108 9602 e001 d622 a108 9822 e001 d04b 0000
0406020  900a 20ff d027 bffc da07 bff4 de07 bffc e04b 400f a210 0010 808c 6080 0280 0007 0100 0000 d007 bffc 1300 0124 d022 6270
0406100  1080 0015 0100 0000 d407 bffc 80a2 a00a 1280 0005 0100 0000 d007 bfec 7fff fc7f 0100 0000 d607 bff8 d807 bffc d82a c000
0406160  da07 bff8 9a03 6001 da27 bff8 de07 a04c 9e23 e001 de27 a04c 8090 000f 14bf ffcf 0100 0000 2100 0124 e004 2270 8090 0010
0406240  0680 0019 0100 0000 d007 bff0 8090 0008 0280 0008 0100 0000 d007 bfec d207 bffc 7fff fcd9 0100 0000 1080 000f 0100 0000
0406320  d007 bff8 d207 bffc d22a 0000 d407 bff8 9402 a001 d427 bff8 d607 bffc 80a2 e00a 1280 0005 0100 0000 d007 bfec 7fff fc57
0406400  0100 0000 d807 bff8 c02b 0000 da07 bff8 9a03 6001 da27 bff8 de07 bff8 e007 a044 a223 c010 e227 bffc e407 bff4 e64c 8000
0406460  a60c e07f a72c e018 a73c e018 e62c 8000 e807 a048 e827 bff8 ea07 bff8 ec4d 4000 ae10 0016 8090 0017 0280 0011 0100 0000
0406540  f007 bff8 f24e c000 b410 0019 b60e a0ff f807 bff4 fa4f 001b ba0f 607f bb2f 6018 bb3f 6018 fa2f 001b d007 bff8 9002 2001
0406620  d027 bff8 10bf ffed 0100 0000 d007 bffc 1080 0003 0100 0000 9010 2000 b010 0008 81c7 e008 81e8 0000 033f ffff 8200 6380
0406700  9de3 8001 f027 a044 f227 a048 f427 a04c d007 a044 d027 bfe0 d207 bfe0 8090 0009 0280 0009 0100 0000 d407 bfe0 d602 a114
0406760  190c 24e0 9813 2124 80a2 c00c 0280 0006 0100 0000 1100 0101 9012 21ce 7fff f892 0100 0000 da07 a044 da27 bff4 de07 bfe0
0407040  a003 e14c e027 bfec c027 bfe8 d007 bff4 9002 2004 d207 a048 9410 20f8 d607 a044 7fff ff0b 0100 0000 9022 2001 d207 bfe8
```

```
0407120  9202 4008 d227 bfe8 1500 0124 d402 a270 90a2 bffe 0280 0004 0100 0000 1080 001c 0100 0000 d607 a04c 8090 000b 0280 0016
0407200  0100 0000 d007 bfec d202 0000 8090 0009 1280 000c 0100 0000 d007 bfe0 d202 2130 9010 20fc 4000 0e1b 0100 0000 d207 bfec
0407260  d022 4000 d407 bfec d602 8000 c022 c000 d807 bfec da03 0000 da27 bff4 de07 bff4 de27 bfec 10bf ffd6 0100 0000 e007 a04c
0407340  8090 0010 1280 0005 0100 0000 9010 2000 1080 0041 0100 0000 e207 a044 e227 bff4 e407 bfe0 e604 a14c e807 bff4 e625 0000
0407420  d007 bfe8 9002 2001 d207 a04c 4000 0dfd 0100 0000 d027 bff0 ea07 bff0 ea27 bff8 9610 20f7 d027 bfe4 d207 bfe4 d407 bfe8
0407500  80a2 400a 0480 0004 0100 0000 d607 bfe8 d627 bfe4 d807 bfe4 da07 bfe8 9a23 400c da27 bfe8 de07 bff4 a003 e004 e027 bffc
0407560  e207 bfe4 a224 6001 e227 bfe4 8090 0011 0690 000e 0100 0000 e407 bff8 e607 bffc e84c c000 e82c 8000 ea07 bffc aa05 6001
0407640  ea27 bffc ec07 bff8 ac05 a001 ec27 bff8 10bf fff0 0100 0000 ee07 bff4 f005 c000 f027 bff4 f207 bfe8 8090 0019 14bf ffd9
0407720  0100 0000 f407 bff8 c02e 8000 f607 a044 c02e c000 d007 bff0 1080 0003 0100 0000 9010 2000 b010 0008 81c7 e008 81e8 0000
0410000  033f ffff 8200 6378 9de3 8001 f027 a044 d007 a044 d027 bfdc d207 bfdc 8090 0009 0280 0009 0100 0000 d407 bfdc d602 a114
0410060  190c 24e0 9813 2124 80a2 c00c 0280 0006 0100 0000 1100 0101 9012 21d6 7fff f802 0100 0000 da07 bfdc da27 bfe4 de07 bfdc
0410140  a003 e154 e027 bfe0 d007 bfe4 d027 bfe8 d207 bfdc d402 610c 9422 a001 d422 610c 8090 000a 1680 0007 0100 0000 d007 bfdc
0410220  7fff fb89 0100 0000 1080 0009 0100 0000 d607 bfdc d802 e108 9903 2001 d822 e108 9a23 2001 d04b 4000 900a 20ff d027 bffc
0410300  de07 bfe0 e007 bffc e24b c010 a410 0011 e427 bff8 e607 bff8 808c e010 0280 0029 0100 0000 d007 bffc 80a2 200a 1280 0007
0410360  0100 0000 d007 bfdc 7fff fb58 0100 0000 1080 0020 0100 0000 d007 bffc 80a2 202f 1280 0010 0100 0000 d007 bfdc 9210 2001
0410440  7fff fbda 0100 0000 80a2 202a 1280 0007 0100 0000 d007 bfdc 7fff fc48 0100 0000 1080 01ff 0100 0000 1080 000e 0100 0000
0410520  d007 bfdc 9210 2001 7fff fbcc 0100 0000 d207 bfe0 d44a 4008 9610 000a 80a2 e024 1280 0004 0100 0000 9810 2004 d827 bff8
0410600  1080 01aa 0100 0000 9010 2100 d027 bff4 d007 bfe8 d207 bffc d22a 0000 d407 bfe8 9402 a001 d427 bfe8 d607 bfdc d802 e10c
0410660  9823 2001 d822 e10c 8090 000c 1680 0007 0100 0000 d007 bfdc 7fff fb3b 0100 0000 1080 0009 0100 0000 da07 bfdc de03 6108
0410740  9e03 e001 de23 6108 a023 e001 d04c 0000 900a 20ff d027 bffc e207 bff4 a224 6001 e227 bff4 8090 0011 1480 000f 0100 0000
0411020  e407 bfe0 e607 bffc e84c 8013 aa10 0014 808d 6020 0280 0008 0100 0000 d007 bfdc 7fff fb60 0100 0000 d027 bffc 10bf fff5
0411100  0100 0000 ec07 bfe0 ee07 bffc f04d 8017 b210 0018 808e 6020 12bf ffce 0100 0000 d007 bfdc d207 bffc 7fff fb6f 0100 0000
0411160  f407 bfdc f656 a124 b810 001b f827 bfec fa07 bfe8 c02f 4000 d007 bfdc d24a 212d 8090 0009 0280 0005 0100 0000 d007 bfe4
0411240  7fff a230 0100 0000 d407 bfdc d64a a12c 8090 000b 0280 0012 0100 0000 9027 a014 d807 bfdc d203 2134 d607 bfe8 da07 bfe4
0411320  9622 c00d d407 bfe4 7fff dbc1 0100 0000 8090 0008 1280 0006 0100 0000 de07 bfdc e053 e124 a210 0010 e227 bfec 1080 015c
0411400  0100 0000 e407 bfdc e654 a126 a810 0013 e827 bfec aa10 2100 ea27 bff4 d007 bfe8 d207 bffc d22a 0000 d407 bfe8 9402 a001
0411460  d427 bfe8 d607 bff8 80a2 e024 0280 0006 0100 0000 d807 bfdc da53 2128 9e10 000d de27 bfec e007 bfdc e204 210c a224 6001
0411540  e224 210c 8090 0011 1680 0007 0100 0000 d007 bfdc 7fff fad0 0100 0000 1080 0009 0100 0000 e407 bfdc e604 a108 a604 e001
0411620  e624 a108 a824 e001 d04d 0000 900a 20ff d027 bffc ea07 bfe0 ec07 bffc ee4d 4016 b010 0017 f027 bff8 f207 bff4 b226 6001
0411700  f227 bff4 8090 0019 1480 000d 0100 0000 d007 bfdc c202 2144 d207 bfdc d402 6104 d202 8000 1100 0101 9012 21dd 9fc0 4000
0411760  0100 0000 1080 003d 0100 0000 d607 bff8 808a e020 0280 0004 0100 0000 1080 0035 0100 0000 d807 bff8 808b 2040 1280 0004
0412040  0100 0000 1080 0031 0100 0000 da07 bffc 80a3 602e 1280 000b 0100 0000 d007 bfdc 9210 2001 7fff fb11 0100 0000 80a2 202e
0412120  1280 0004 0100 0000 1080 0024 0100 0000 de07 bffc 80a3 e02b 0280 0006 0100 0000 e007 bffc 80a4 202d 1280 001a 0100 0000
0412200  e207 bfe8 e44c 7fff a610 0012 80a4 e065 0280 0008 0100 0000 e807 bfe8 ea4d 3fff ac10 0015 80a5 a045 1280 000c 0100 0000
0412260  d007 bfdc 9210 2001 7fff faf4 0100 0000 ee07 bfe0 f04d c008 b210 0018 80a6 6024 0280 0004 0100 0000 1080 0004 0100 0000
0412340  10bf ff8f 0100 0000 d007 bfdc d207 bffc 7fff facd 0100 0000 f407 bfdc f656 a128 b810 001b fa07 bfec 80a7 401c 1280 0007
0412420  0100 0000 d007 bfe8 c02a 0000 d007 bfe4 7fff a190 0100 0000 1080 00d1 0100 0000 c027 bff4 d007 bfe8 d207 bffc d22a 0000
0412500  d407 bfe8 9402 a001 d427 bfe8 d607 bfdc d802 e110 da07 bff4 9a03 6001 da27 bff4 80a3 400c 0680 0004 0100 0000 1080 003e
0412560  0100 0000 d007 bfdc d207 bff4 7fff fac3 0100 0000 d027 bffc de07 bfe0 e007 bffc e24b c010 a410 0011 e427 bff8 e607 bff8
0412640  a80c e00f 80a5 2003 0280 0004 0100 0000 1080 002d 0100 0000 ea07 bff8 808d 6010 0280 0027 0100 0003 d207 bff4 9202 6001
0412720  1007 bfdc 7fff faad 0100 0000 d027 bff0 d007 bffc 80a2 202f 1280 000a 0100 0000 d007 bff0 80a2 202a 1280 0004 0100 0000
0413000  1080 0019 0100 0000 1080 0015 0100 0000 d207 bffc 80a2 602e 1280 0011 0100 0000 d007 bfe8 d24a 3fff 9410 0009 80a2 a02e
0413060  0280 000b 0100 0000 d607 bfe0 d807 bff0 da4a c00c 9e10 000d 80a3 e024 1280 0004 0100 0000 1080 0004 0100 0000 10bf ffb6
0413140  0100 0000 e007 bfe8 c02c 0000 e207 bff4 80a4 6001 0480 0015 0100 0000 9027 a014 e407 bfdc d204 a134 d407 bfe4 d607 bff4
0413220  7fff dad3 0100 0000 8090 0008 1280 000b 0100 0000 d007 bff4 9022 2001 d027 bff4 d207 bfe8 9222 6001 d227 bfe8 c02a 4000
0413300  10bf ffeb 0100 0000 d407 bff4 80a2 a001 1280 0017 0100 0000 d007 bfdc d202 2138 8090 0009 1280 0008 0100 0000 d407 bfdc
0413360  d652 a120 9810 000b d827 bfec 1080 000c 0100 0000 da07 bfdc de03 6138 e007 bfe4 e24c 0000 a410 0011 a60c a0ff a92c e001
0413440  ea53 c014 ac10 0015 ec27 bfec ee07 bff4 ae25 e001 ee27 bff4 8090 0017 0480 0007 0100 0000 d007 bfdc 7fff fa1a 0100 0000
0413520  10bf fff7 0100 0000 1080 0045 0100 0000 1080 0077 0100 0000 d007 bfdc d207 bffc 7fff fbd7 0100 0000 f007 bfe8 b006 0008
0413600  f027 bfe8 f207 bfdc f406 6138 f607 bffc b92e e001 fa56 801c 9010 001d d027 bfec 1080 0033 0100 0000 d207 bfdc d452 6122
0413660  9610 000a d627 bfec 1080 002d 0100 0000 d807 bfe8 da07 bffc da2b 0000 de07 bfe8 9e03 e001 de27 bfe8 e007 bfdc e204 2138
0413740  8090 0011 1280 0008 0100 0000 e407 bfdc e654 a120 a810 0013 e827 bfec 1080 0009 0100 0000 ea07 bfdc ec05 6138 ee07 bffc
0414020  b12d e001 f255 8018 b410 0019 f427 bfec 1080 0013 0100 0000 d007 bff8 900a 200f 9022 2001 80a2 2005 18bf ffe2 912a 2002
0414100  1300 008e 9212 6054 d002 0009 81c2 0000 0100 0000 0002 37a8 0002 3760 0002 3530 0002 3304 0002 3188 0002 3768 f607 bfe8
0414160  c02e c000 f807 bfec 3b00 0009 ba17 630f 80a7 001d 1480 0005 0100 0000 d007 bfec 1080 002e 0100 0000 d007 bfdc d202 2140
```

```
0414240 8090 0009 0280 001d 0100 0000 d407 bfec 1700 001d 9612 e130 80a2 800b 0280 0017 0100 0000 d007 bfdc c202 2140 d207 bfec
0414320 1500 0013 9412 a220 9222 400a d007 bfdc 9fc0 4000 0100 0000 d027 bfec d607 bfec 1900 0009 9813 230f 80a2 c00c 1480 0005
0414400 0100 0000 d007 bfec 1080 0010 0100 c000 1080 000b 0100 0000 d007 bfdc c202 2144 d207 bfdc d402 6104 d202 8000 1100 0101
0414460 9012 21fd 9fc0 4000 0100 0000 10bf fdcb 0100 0000 9010 2000 b010 0008 81c7 e008 81e8 0000 033f ffff 8200 6390 9de3 8001
0414540 f027 a044 f227 a048 d007 a048 d202 0000 d227 bffc 9410 2100 d427 bff4 d007 bffc d202 0000 9222 6001 d222 0000 8090 0009
0414620 0680 000b 0100 0000 d407 bffc d602 a004 9602 e001 d622 a004 9822 e001 da0b 0000 9e10 000d 1080 0006 0100 0000 d007 bffc
0414700 4000 61f6 0100 0000 9e10 0008 de27 bff8 e007 bff8 80a4 3fff 1280 0004 0100 0000 1080 000f 0100 0000 e207 a044 e407 bff8
0414760 e42c 4000 e607 a044 a604 e001 e627 a044 e807 bff4 a825 2001 e827 bff4 ea07 bff4 8090 0015 14bf ffda 0100 0000 9010 2100
0415040 ec07 bff4 9022 0016 1080 0003 0100 0000 9010 2000 b010 0008 81c7 e008 81e8 0000 033f ffff 8200 6398 9de3 8001 f027 a044
0415120 f227 a048 9010 2100 d027 bff8 1100 011e d002 22a0 9022 2001 1300 011e d022 62a0 8090 0008 0680 000c 0100 0000 1500 011e
0415200 d402 a2a4 9402 a001 1700 011e d422 e2a4 9822 a001 da0b 0000 9e10 000d 1080 0007 0100 0000 1100 011e 9012 22a0 4000 61bb
0415260 0100 0000 9e10 0008 de27 bffc e007 bffc 80a4 3fff 1280 0004 0100 0000 1080 0015 0100 0000 e207 a044 e407 bffc e42c 4000
0415340 e607 a044 a604 e001 e627 a044 e807 bff8 a825 2001 e827 bff8 ea07 bffc 80a5 600a 1280 0004 0100 0000 1080 0006 0100 0000
0415420 ec07 bff8 8090 0016 14bf ffd1 0100 0000 9010 2100 ee07 bff8 9022 0017 1080 0003 0100 0000 9010 2000 b010 0008 81c7 e008
0415500 81e8 0000 033f ffff 8200 63b8 9de3 8001 f027 a044 f227 a048 d007 a048 d202 0000 d227 bffc 9410 2100 d427 bff8 d007 bffc
0415560 d24a 0000 9410 0009 8090 000a 1280 0004 0100 0000 1080 0012 0100 0000 d607 a044 d807 bffc da4b 0000 da2a c000 de07 bffc
0415640 9e03 e001 de27 bffc e007 a044 a004 2001 e027 a044 e207 bff8 a224 6001 e227 bff8 8090 0011 14bf ffea 0100 0000 e407 a048
0415720 e607 bffc e624 8000 9010 2100 e807 bff8 9022 0014 1080 0003 0100 0000 9010 2000 b010 0008 81c7 e008 81e8 0000 0000 0000
0416000 033f ffff 8200 63a0 9de3 8001 f027 a044 f227 a048 f427 a04c d007 a044 d207 a048 d407 a04c 4000 614e 0100 0000 1100 0106
0416060 9012 200a 4000 614a 0100 0000 9010 2008 4000 610b 0100 0000 9010 2000 b010 0008 81c7 e008 81e8 0000 033f ffff 8200 6398
0416140 9de3 8001 f027 a044 d007 a044 4000 6133 0100 0000 9002 2001 1300 0129 d202 6200 4000 0aa4 0100 0000 d027 bffc d007 bffc
0416220 d207 a044 4000 6111 0100 0000 d007 bffc 1080 0003 0100 0000 9010 2000 b010 0008 81c7 e008 81e8 0000 033f ffff 8200 6398
0416300 9de3 8001 1100 0129 9012 23b0 1300 0129 d202 6214 4000 60f5 0100 0000 d027 bffc d007 bffc 1080 0003 0100 0000 9010 2000
0416360 b010 0008 81c7 e008 81e8 0000 033f ffff 8200 6398 9de3 8001 f027 a044 1100 012a 9012 22b0 d027 bff8 d207 a044 d402 4000
0416440 9422 a001 d422 4000 8090 000a 0680 000b 0100 0000 d607 a044 d802 e004 9803 2001 d822 e004 9a23 2001 de0b 4000 a010 000f
0416520 1080 0006 0100 0000 d007 a044 4000 610f 0100 0000 a010 0008 e027 bffc e207 bffc 80a4 600a 0280 002f 0100 0000 e407 bffc
0416600 80a4 bfff 0280 002b 0100 0000 d007 bffc 80a2 2009 1280 0004 0100 0000 9210 2020 d227 bffc d407 bff8 1700 012a 9612 e378
0416660 80a2 800b 1a80 0008 0100 0000 d807 bff8 da07 bffc da2b 0000 de07 bff8 9e03 e001 de27 bff8 e007 a044 e204 0000 a224 6001
0416740 e224 0000 8090 0011 0680 000b 0100 0000 e407 a044 e604 a004 a604 e001 e624 a004 a824 e001 ea0d 0000 ac10 0015 1080 0006
0417020 0100 0000 d007 a044 4000 60e0 0100 0000 ac10 0008 ec27 bffc 10bf ffd1 0100 0000 ee07 bff8 c02d c000 d007 bffc 80a2 3fff
0417100 0280 0005 0100 0000 9010 2001 1080 0003 0100 0000 9010 2000 1080 0003 0100 0000 9010 2000 b010 0008 81c7 e008 81e8 0000
0417160 033f ffff 8200 63b8 9de3 8001 f027 a044 d007 a044 d24a 0000 9410 0009 80a2 a020 1280 0007 0100 0000 d607 a044 9602 e001
0417240 d627 a044 10bf fff7 0100 0000 1900 012a 9813 23b0 d827 bffc da07 a044 de4b 4000 a010 000f 80a4 2020 0280 0014 0100 0000
0417320 e207 a044 e44c 4000 a610 0012 8090 0013 0280 000e 0100 0000 e807 bffc ea07 a044 ec4d 4000 ec2d 0000 ee07 a044 ae05 e001
0417400 ee27 a044 f007 bffc b006 2001 f027 bffc 10bf ffea 0100 0000 f207 bffc c02e 4000 f407 a044 f64e 8000 b810 001b 80a7 2020
0417460 1280 0007 0100 0000 fa07 a044 ba07 6001 fa27 a044 10bf fff7 0100 0000 d007 a044 1080 0003 0100 0000 9010 2000 b010 0008
0417540 81c7 e008 81e8 0000 033f ffff 8200 63a0 9de3 8001 f027 a044 f227 a048 d007 a048 8090 0008 1280 0005 0100 0000 1300 0106
0417620 9212 600c d227 a048 d007 a044 d207 a048 4000 604e 0100 0000 d007 a048 4000 6063 0100 0000 d407 a044 9002 8008 1080 0003
0417700 0100 0000 9010 2000 b010 0008 81c7 e008 81e8 0000 033f ffff 8200 6398 9de3 8001 1100 0102 d002 21c8 8090 0008 1280 0005
0417760 0100 0000 9010 2000 1080 0021 0100 0000 1100 0102 d002 21c8 4000 604f 0100 0000 d027 bffc d207 bffc 80a2 6001 0680 0008
0420040 0100 0000 d407 bffc 1700 03d0 9612 e240 80a2 800b 0480 0005 0100 0000 9010 2000 1080 000f 0100 0000 d407 bffc 9422 a001
0420120 1300 0106 9212 600e 1100 012b 9012 22b0 4000 6015 0100 0000 1100 012b 9012 22b0 1080 0003 0100 0000 9010 2000 b010 0008
0420200 81c7 e008 81e8 0000 033f ffff 8200 6398 9de3 8001 f027 a044 d007 a044 d24a 0000 9410 0009 8090 000a 1280 0005 0100 0000
0420260 9010 2000 1080 002c 0100 0000 d007 a044 4000 601e 0100 0000 d607 a044 9802 c008 9a23 2001 da27 bffc de07 bffc e04b c000
0420340 a210 0010 80a4 602e 0280 001b 0100 0000 e407 bffc e64c 8000 a810 0013 80a5 202e 0280 0015 0100 0000 d007 bffc d207 a044
0420420 80a2 0009 0880 0008 0100 0000 d407 bffc d64a 8000 9810 000b 80a3 202f 1280 0005 0100 0000 9010 2000 1080 000b 0100 0000
0420500 da07 bffc 9a23 6001 da27 bffc 10bf ffe3 0100 0000 d007 bffc 1080 0003 0100 0000 9010 2000 b010 0008 81c7 e008 81e8 0000
0420560 033f ffff 8200 6398 9de3 8001 f027 a044 d007 a044 d24a 0000 9410 0009 8090 000a 1280 0005 0100 0000 9010 2000 1080 0021
0420640 0100 0000 d007 a044 4000 5fe4 0100 0000 d607 a044 9802 c008 9a23 2001 da27 bffc de07 bffc e04b c000 a210 0010 80a4 602f
0420720 0280 000f 0100 0000 d007 bffc d207 a044 80a2 0009 1880 0005 0100 0000 9010 2000 1080 000c 0100 0000 d407 bffc 9422 a001
0421000 d427 bffc 10bf ffef 0100 0000 d007 bffc 9002 2001 1080 0003 0100 0000 9010 2000 b010 0008 81c7 e008 81e8 0000 033f ffff
0421060 8200 63a0 9de3 8001 f027 a044 f227 a048 1100 0102 d002 2200 8090 0008 0280 0004 0100 0000 1080 000c 0100 0000 1100 0106
0421140 9012 2011 d207 a044 d407 a048 4000 5fbc 0100 0000 9210 2001 1500 0102 d222 a200 9010 2000 b010 0008 81c7 e008 81e8 0000
0421220 033f ffff 8200 6278 9de3 8001 f027 a044 f227 a048 f427 a04c d007 a048 8090 0008 1280 0005 0100 0000 d007 a044 d027 a048
0421300 c027 a044 d207 a048 8090 0009 1280 0006 0100 0000 1100 0106 9012 2043 7fff fe49 0100 0000 9027 a120 d207 a048 4000 5f7b
```

```
0421360 0100 0000 d407 a044 809c 000a 0280 0009 0100 0000 1100 012a 9012 21b0 d207 a044 4000 5f72 0100 0000 1080 0021 0100 0000
0421440 1100 012a c02a 21b0 d007 a048 7fff ff57 0100 0000 d027 bff0 d207 bff0 8090 0009 0280 0017 0100 0000 1100 012a 9012 21b0
0421520 d207 a048 4000 5f61 0100 0000 d007 bff0 d207 a048 9422 0009 1700 012a 9612 e1b0 c02a 800b d807 bff0 9a03 2001 da27 a048
0421600 9027 a120 d207 a048 4000 5f54 0100 0000 1f00 012a 9e13 e1b0 de27 a044 9027 a120 7fff 9df0 0100 0000 9027 a004 9427 a120
0421660 1300 0129 d202 6204 9610 2000 7fff d788 0100 0000 8090 0008 1280 000a 0100 0000 9027 a004 1300 0129 d202 6204 1500 0106
0421740 9412 a05f 9610 2000 7fff d77d 0100 0000 e007 a04c 8090 0010 1280 000c 0100 0000 e207 bffc e404 6008 e64c 8000 a810 0013
0422020 80a5 202b 1280 0005 0100 0000 aa10 2001 1080 0003 0100 0000 aa10 2000 2d00 0129 ea25 a210 ee07 a04c 8090 0017 0280 0007
0422100 0100 0000 f007 bffc f206 2010 f406 600c 1080 0005 0100 0000 f6c7 bffc f806 e010 f407 2008 3b00 0129 f427 6214 d007 bffc
0422160 1202 200c d227 bff4 d407 bff4 1700 0129 d422 e218 1900 012b 9813 20b0 d827 bff8 1b00 012b c02b 61b0 1f00 0102 de03 e1e8
0422240 e04b c000 e02f bede c02f bedf c027 bfec a210 2001 e227 bfe0 e407 bff4 e64c 8000 a810 0013 80a5 202f 0280 0008 0100 0000
0422320 d007 bff8 1300 0106 9212 6068 7fff fea3 0100 0000 d027 bff8 d007 bff4 d24a 0000 d22f bfeb d407 bff4 9402 a001 d427 bff4
0422400 d64f bfeb 9810 000b 8090 000c 1280 000a 0100 0000 d007 bfe0 80a2 2002 1680 0004 0100 0000 4000 053d 0100 0000 1080 018d
0422460 0100 0000 1080 0179 0100 0000 d007 bff4 d24a 0000 d22f bfeb d407 bff4 9402 a001 d427 bff4 d64f bfeb 9810 000b 80a3 2046
0422540 1280 0007 0100 0000 1b00 0102 da03 61c0 da27 bfe4 1080 005c 0100 0000 de4f bfeb a010 000f 80a4 204d 1280 0007 0100 0000
0422620 2300 0102 e204 61c4 e227 bfe4 1080 0052 0100 0000 e44f bfeb a610 0012 80a4 e043 1280 0006 0100 0000 a827 a122 e827 bfe4
0422700 1080 0049 0100 0000 ea4f bfeb ac10 0015 80a5 a054 1280 0007 0100 0000 2f00 0102 ee05 e1c8 ee27 bfe4 1080 003f 0100 0000
0422760 f04f bfeb b210 0018 80a6 5056 1280 0007 0100 0000 3500 0102 f406 a1cc f427 bfe4 1080 0035 0100 0000 f64f bfeb b810 001b
0423040 80a7 2050 1280 0007 0100 0000 3b00 0102 fa07 61d0 fa27 bfe4 1080 002b 0100 0000 d04f bfeb 9210 0008 80a2 6053 1280 0007
0423120 0100 0000 1500 0102 d402 a1d4 d427 bfe4 1080 0021 0100 0000 d64f bfeb 9810 000b 80a3 204f 1280 0006 0100 0000 da07 a048
0423200 da27 bfe4 1080 0018 0100 0000 de4f bfeb a010 000f 80a4 204c 1280 0007 0100 0000 7fff fe4d 0100 0000 d027 bfe4 1080 000e
0423260 0100 0000 e24f bfeb a410 0011 80a4 a041 1280 0007 0100 0000 2700 012a a614 e1b0 e627 bfe4 1080 0004 0100 0000 4000 04cf
0423340 0100 0000 d007 bff8 d207 bfe4 7fff fe1f 0100 0000 d027 bff8 1080 0118 0100 0000 e807 bff4 ea4d 0000 ea2f bfeb ec07 bff4
0423420 ac05 a001 ec27 bff4 ee4f bfeb b010 0017 80a6 2050 1280 0007 0100 0000 3300 0102 f206 61d8 f227 bfe4 1080 002c 0100 0000
0423500 f44f bfeb b610 001a 80a6 e054 1280 0007 0100 0000 3900 0102 f807 21dc f827 bfe4 1080 0022 0100 0000 fa4f bfeb 9010 001d
0423560 80a2 2044 1280 0007 0100 0000 1300 0102 d202 61e0 d227 bfe4 1080 0018 0100 0000 d44f bfeb 9610 000a 80a2 e041 1280 0007
0423640 0100 0000 1900 0102 d803 21e4 d827 bfe4 1080 000e 0100 0000 da4f bfeb 9e10 000d 80a3 e043 1280 0007 0100 0000 2100 0102
0423720 e004 21e8 e027 bfe4 1080 0004 0100 0000 4000 048e 0100 0000 d007 bff8 d207 bfe4 7fff fdde 0100 0000 d027 bff8 1080 00d7
0424000 0100 0000 e207 bfe0 a204 6001 e227 bfe0 a424 6001 80a4 a001 0280 0004 0100 0000 4000 047e 0100 0000 e607 bff8 2900 012b
0424060 a815 20b0 80a4 c014 0280 0008 0100 0000 ea07 bff8 ac10 202f ec2d 4000 ee07 bff8 ae05 e001 ee27 bff8 f007 bff8 c02e 0000
0424140 3300 012a b216 60b0 f227 bff8 f407 a044 8090 001a 0280 0018 0100 0000 d007 bff8 d207 a044 7fff f1b9 0100 0000 d027 bff8
0424220 d007 bff4 d24a 0000 9410 0009 80a2 a02e 0280 000d 0100 0000 d607 bff4 d84a c000 9a10 000c 8090 000d 0280 0007 0100 0000
0424300 de07 bff4 9e03 e001 de27 bff4 10bf fff1 0100 0000 1080 00a1 0100 0000 e007 bfe0 a004 2001 e027 bfe0 a224 2001 80a4 6002
0424360 0280 0004 0100 0000 4000 0448 0100 0000 e407 bff8 c02c 8000 1100 012a 9012 20b0 7fff fe18 0100 0000 d027 bff0 e607 bff0
0424440 8090 0013 0280 0021 0100 0000 1100 012b 9012 20b0 1300 012a 9212 60b0 4000 5de7 0100 0000 d007 bff0 1300 012a 9212 60b0
0424520 9422 0009 1700 012b 9612 e0b0 c02a 800b 9027 a120 d207 bff0 4000 5ddc 0100 0000 9227 a120 1100 012a 9012 20b0 4000 5dd7
0424600 0100 0000 d807 bff0 1b00 012a 9a13 60b0 9e23 000d e007 bff8 a024 000f e027 bff8 e207 bff8 c02c 4000 e407 bff8 2700 012a
0424660 a614 e0f0 80a4 8013 0880 0013 0100 0000 1100 0106 9012 2069 1300 012a 9212 60b0 4000 5de3 0100 0000 1100 012a 9012 20f0
0424740 d027 bff8 d207 bff8 c02a 4000 1100 0106 9012 2082 1300 012a 9212 60b0 4000 5dd8 0100 0000 1100 012a 9012 20b0 7fff fd9f
0425020 0100 0000 d027 bff0 d407 bff0 8090 000a 0280 000e 0100 0000 1100 012a 9012 20b0 d207 bff0 7fff f1fe 0100 0000 d007 bff0
0425100 d027 bff8 d207 bff0 c02a 4000 d407 bff0 9402 a001 d427 bff0 1100 012a 9012 21b0 1300 012a 9212 60b0 4000 5d9c 0100 0000
0425160 d607 bff8 9810 202e d82a c000 da07 bff8 9a03 6001 da27 bff8 de07 bff8 de27 bfec 1080 0032 0100 0000 e007 bff8 a210 202f
0425240 e22c 0000 e407 bff8 a404 a001 e427 bff8 1080 c02a 0100 0000 e607 bfe0 a604 e001 e627 bfe0 a824 e001 80a5 2003 0280 0004
0425320 0100 0000 4000 03d1 0100 0000 ea07 bff8 c02d 4000 2d00 012b ac15 a1b0 ec27 bff8 1080 001a 0100 0000 ee07 bff8 f04f bfeb
0425400 f02d c000 f207 bff8 b206 6001 f227 bff8 1080 0012 0100 0000 d04f bfeb 80a2 2021 02bf ffde 80a2 2024 02bf fef6 80a2 2026
0425460 02bf fe83 80a2 202e 02bf ff69 80a2 202f 02bf ff31 80a2 2040 02bf ffdc 0100 0000 10bf ffea 0100 0000 10bf fe64 0100 0000
0425540 f407 bff8 c02e 8000 f607 bfec 8090 001b 0280 0014 0100 0000 f807 bfec ba07 2008 d007 bff8 80a7 4008 1a80 000e 0100 0000
0425620 1100 0106 9012 2096 d207 bfec 4000 5d70 0100 0000 d007 bfec c02a 2008 1100 0106 9012 20af d207 bfec 4000 5d69 0100 0000
0425700 9010 2000 b010 0008 81c7 e008 81e8 0000 033f ffff 8200 6398 9de3 8001 f027 a044 d007 a044 8090 0008 1280 0004 0100 0000
0425760 1080 0035 0100 0000 1300 0129 d202 63ac d227 bffc d407 bffc 8090 000a 0280 000d 0100 0000 d607 bffc d802 e004 da07 a044
0426040 80a3 000d 0280 0007 0100 0000 de07 bffc e003 c000 e027 bffc 10bf fff3 0100 0000 e207 bffc 8090 0011 1280 0012 0100 0000
0426120 9010 2010 1300 0129 d202 6200 4000 06ad 0100 0000 d027 bffc d007 bffc 1300 0129 d202 63ac d222 0000 d407 bffc 1700 0129
0426200 d422 e3ac d807 bffc da07 a044 da23 2004 1100 0129 9012 23b0 7fff fbf0 0100 0000 de07 bffc d023 e008 1100 012a 9012 21b0
0426260 7fff fbea 0100 0000 e007 bffc d024 200c 9010 2000 b010 0008 81c7 e008 81e8 0000 033f ffff 8200 6390 9de3 8001 f027 a044
0426340 1100 012b d04a 20b0 9210 0008 8090 0009 1280 0005 0100 0000 9410 2001 1080 0003 0100 0000 9410 2000 d427 bffc 1700 0129
0426420 d602 e210 8090 c005 0280 0006 0100 0000 1900 0129 d803 2208 1080 0003 0100 0000 9810 2002 d827 bff8 1080 0006 0100 0000
```

```
0426500  9010 2001 d027 bffc 9210 2002 d227 bff8 c027 bff0 d407 bff0 8090 000a 1280 006e 0100 0000 d607 bffc d807 bff8 80a2 c00c
0426560  1680 0069 0100 c000 d007 bffc 932a 2002 1500 0129 9412 a21c d202 400a 1100 0129 9012 23b0 4000 5cd1 0100 0000 1100 0129
0426640  9012 23b0 4000 5ce5 0100 0000 1700 0129 9612 e3b0 9802 000b d827 bff4 da07 bff4 1f00 0129 9e13 e3b0 80a3 400f 0880 0024
0426720  0100 0000 e007 bff4 e24c 3fff a410 0011 90a4 a040 1280 001e 0100 0000 1100 012b d04a 21b0 9210 0008 8090 0009 1280 0004
0427000  0100 0000 1080 003f 0100 0000 d407 bff4 c02a bfff 1100 012b 9012 21b0 7fff 9b80 0100 0000 1100 0129 9012 23b0 1300 012b
0427060  9212 61b0 4000 01c6 0100 0000 1100 0129 9012 23b0 4000 5cbd 0100 0000 1700 0129 9612 e3b0 9802 000b d827 bff4 d007 bff4
0427140  1300 012a 9212 60b0 4000 5c9c 0100 0000 d007 bff4 7fff 9b3b 0100 0000 7fff fb8f 0100 0000 d027 bff0 da07 bff0 8090 000d
0427220  1280 001c 0100 0000 de07 a044 8090 000f 1280 0018 0100 0000 d007 bff4 7fff 9b5c 0100 0000 7fff fb81 0100 0000 d027 bff0
0427300  d007 bff0 8090 c008 1280 000e 0100 0000 d207 bffc 80a2 6002 1680 000a 0100 0000 d007 bff4 1300 012a 9212 60b0 4000 5c7b
0427360  0100 0000 7fff fb71 0100 0000 d027 bff0 d007 bffc 9002 2001 d027 bffc 10bf ff92 0100 0000 d207 bff0 8090 0009 1280 000e
0427440  0100 0000 1100 0129 9012 23b0 1300 012a 9212 60b0 4000 5c69 0100 0003 1100 0129 9012 23b0 7fff 9b07 0100 0000 1080 0005
0427520  0100 0000 d007 bff0 7fff ff1e 0100 0000 d007 bff0 1080 0003 0100 0000 9010 2000 b010 0008 81c7 e008 81e8 0000 033f ffff
0427600  8200 63a0 9de3 8001 f027 a044 f227 a048 f427 a04c f627 a050 d007 a050 8090 0008 1280 0006 0100 0000 1300 0106 9212 60ed
0427660  1080 0004 0100 0000 1300 0106 9212 60ef d223 a05c d607 a04c 8090 000b 1280 0006 0100 0000 1700 0106 9612 e0e7 1080 0003
0427740  0100 0000 d607 a04c d407 a048 8090 000a 1280 0006 0100 0000 1500 0106 9412 a0e1 1080 0003 0100 0000 d407 a048 d207 a044
0430020  1100 0106 9012 20c3 1900 0129 9813 23b0 1b00 0129 da03 6214 4000 5c4d 0100 0000 9010 2000 b010 0008 81c7 e008 81e8 0000
0430100  033f ffff 8200 63c0 9de3 8001 1100 0102 c022 21e8 9210 2000 1500 0102 d222 a1e4 1700 0102 d222 e1e0 1900 0102 d223 21dc
0430160  1b00 0102 d223 61d8 1f00 0102 de03 e1fc 8090 000f 0280 0006 0100 0000 4000 00cd 0100 0000 1080 0004 0100 0000 4000 00a6
0430240  0100 0000 9010 2000 b010 0008 81c7 e008 81e8 0000 033f ffff 8200 6398 9de3 8001 f027 a044 f227 a048 4000 009b 0100 0000
0430320  d007 a044 d207 a048 9410 2001 7fff fc6d 0100 0000 9010 2001 7fff fefa 0100 0000 d027 bffc 1100 0102 d002 21bc 8090 0008
0430400  0280 0009 0100 0000 1100 0106 9012 20f1 d207 a044 d407 a048 d607 bffc 7fff ff98 0100 0000 d007 bffc 1080 0003 0100 0000
0430460  9010 2000 b010 0008 81c7 e008 81e8 0000 033f ffff 8200 6398 9de3 8001 f027 a044 f227 a048 4000 0078 0100 0000 d007 a044
0430540  d207 a048 9410 2000 7fff fc4a 0100 0000 9010 2000 7fff fed7 0100 0000 d027 bffc 1100 0102 d002 21bc 8090 0008 0280 0009
0430620  0100 0000 1100 0106 9012 20fa d207 a044 d407 a048 d607 bffc 7fff ff75 0100 0000 d007 bffc 1080 0003 0100 0000 9010 2000
0430700  b010 0008 81c7 e008 81e8 0000 033f ffff 8200 63b8 9de3 8001 f027 a044 d007 a044 8090 0008 1280 0006 0100 0000 1100 012a
0430760  9012 21b0 1080 0020 0100 0000 1300 0129 d202 63ac d227 bffc d407 bffc 8090 000a 0280 000d 0100 0000 d607 bffc d802 e004
0431040  da07 a044 80a3 000d 0280 0007 0100 0000 de07 bffc e003 c000 e027 bffc 10bf fff3 0100 0000 d007 bffc 8090 0008 0280 0006
0431120  0100 0000 e207 bffc d004 600c 1080 0003 0100 0000 9010 2000 1080 0003 0100 0000 9010 2000 b010 0008 81c7 e008 81e8 0000
0431200  033f ffff 8200 63b8 9de3 8001 f027 a044 d007 a044 8090 0008 1280 0006 0100 0000 1100 0129 9012 23b0 1080 0020 0100 0000
0431260  1300 0129 d202 63ac d227 bffc d407 bffc 8090 c00a 0280 000d 0100 0000 d607 bffc d802 e004 da07 a044 80a3 000d 0280 0007
0431340  0100 0000 de07 bffc e003 c000 e027 bffc 10bf fff3 0100 0000 d007 bffc 8090 0008 0280 0006 0100 0000 e207 bffc d004 6008
0431420  1080 0003 0100 0000 9010 2000 1080 0003 0100 0000 9010 2000 b010 0008 81c7 e008 81e8 0000 033f ffff 8200 63a0 9de3 8001
0431500  1100 0102 d002 21fc 8090 0008 0280 0004 0100 0000 1080 0018 0100 0000 9210 2001 1500 0102 d222 a1fc 9010 2400 4000 0495
0431560  0100 0000 1700 0129 d022 e200 1100 0129 9012 2204 1300 0129 d202 6200 9410 2000 7fff d35b 0100 0000 1900 0129 c023 23ac
0431640  1b00 0129 c023 61f8 4000 0006 0100 0000 9010 2000 b010 0008 81c7 e008 81e8 0000 033f ffff 8200 63c0 9de3 8001 4000 0013
0431720  0100 0000 1100 012b c02a 20b0 1300 0106 9212 6102 1500 0129 d222 a214 9610 2001 1900 0129 d623 2210 4000 0385 0100 0000
0432000  4000 01a8 0100 0000 9010 2000 b010 0008 81c7 e008 81e8 0000 033f ffff 8200 63a0 9de3 8001 1100 012b 9012 20b0 1300 0129
0432060  d022 621c 9410 2001 1700 0129 d422 e208 1100 0106 9012 2104 4000 00df 0100 0000 1080 0004 0100 0000 1080 0016 0100 0000
0432140  1100 0106 9012 2105 4000 00b5 0100 0000 1100 0106 9012 210a 4000 00b1 0100 0000 1100 0106 9012 2112 4000 5b89 0100 0000
0432220  8090 0008 1280 0006 0100 0000 1100 0106 9012 211a 4000 00a6 0100 0000 9010 2000 b010 0008 81c7 e008 81e8 0000 033f ffff
0432300  8200 6398 9de3 8001 f027 a044 d007 a044 4000 5b1a 0100 0000 d207 a044 9402 4008 9622 a001 d627 bffc d807 bffc da4b 0000
0432360  9e10 000d 80a3 e02f 0280 0011 0100 0000 e007 bffc e24c 0000 a410 0011 80a4 a040 0280 000b 0100 0000 d007 bffc 9002 2001
0432440  d027 bffc 9210 202f d22a 0000 d407 bffc 9402 a001 d427 bffc c02a 8000 9010 2000 b010 0008 81c7 e008 81e8 0000 033f ffff
0432520  8200 6398 9de3 8001 f027 a044 f227 a048 d007 a048 d24a 0000 9410 0009 80a2 a02f 1280 0005 0100 0000 d607 a048 9602 e001
0432600  d627 a048 d807 a048 da4b 0000 9e10 000d 8090 000f 1280 0006 0100 0000 1100 0106 9012 2122 7fff f997 0100 0000 d007 a044
0432660  4000 5ae2 0100 0000 e007 a044 a204 0008 e227 bffc e407 bffc e607 a044 80a4 8013 1280 000f 0100 0000 d007 a044 1300 0106
0432740  9212 613e 4000 5abd 0100 0000 d007 a044 4000 5ad2 0100 0000 d207 a044 9402 4008 d427 bffc 1080 0043 0100 0000 d007 bffc
0433020  d24a 3fff 9410 0009 80a2 a02f 1280 0005 0100 0000 d607 bffc 9622 e001 d627 bffc d807 bffc 9a10 202f da2b 0000 de07 bffc
0433100  9e03 e001 de27 bffc e007 a048 e24c 0000 a410 0011 80a4 a05e 1280 002e 0100 0000 d007 a048 9002 2001 d027 a048 d207 a048
0433160  d44a 4000 9610 000a 80a2 e02f 1280 0005 0100 0000 d807 a048 9803 2001 d827 a048 da07 bffc de07 a044 80a3 400f 0880 000b
0433240  0100 0000 e007 bffc e24c 3fff a410 0011 80a4 a02f 1280 0005 0100 0000 e607 bffc a624 e001 e627 bffc e807 bffc ea07 a044
0433320  80a5 0015 0880 000d 0100 0000 ec07 bffc ee4d bfff b010 0017 80a6 202f 0280 0007 0100 0000 f207 bffc b226 6001 f227 bffc
0433400  10bf fff2 0100 0000 10bf ffd0 0100 0000 1007 bffc d207 a048 4000 5a70 0100 0000 d007 bffc 7fff ff66 0100 0000 9010 2000
0433460  b010 0008 81c7 e008 81e8 0000 033f ffff 8200 6298 9de3 8001 f027 a044 d007 a044 4000 5ad7 0100 0000 d027 bffc d007 bffc
0433540  8090 0008 1280 0004 0100 0000 1080 0013 0100 0000 9027 a104 d207 bffc 4000 5a57 0100 0000 9027 a104 1300 0106 9212 613f
```

```
0433620  7fff ff6f 0100 0000 9027 a104 7fff f92f 0100 0000 d027 bffc d007 bffc 4000 0006 0100 0000 9010 2000 b010 0008 81c7 e008
0433700  81e8 0000 033f ffff 8200 6298 9de3 8001 f027 a044 1100 0129 d002 2208 80a2 2064 0680 0006 0100 0000 1100 0106 9012 2148
0433760  7fff f904 0100 0000 1300 0129 d202 6208 952a 6002 1700 0129 9612 e21c d807 a044 d822 800b 1b00 0129 da03 6208 9a03 6001
0434040  1f00 0129 da23 e208 e007 a044 e24c 0000 a410 0011 8090 0012 0280 000e 0100 0000 d007 a044 4000 5a3d 0100 0000 a622 2001
0434120  e807 a044 ea4d 0013 ac10 0015 80a5 a040 1280 0004 0100 0000 1080 0069 0100 0000 1100 0129 9012 23b0 d207 a044 4000 5a17
0434200  0100 0000 1100 0129 9012 23b0 1300 0106 9212 6171 4000 5a2f 0100 0003 2f00 0106 ae15 e17a 3100 0129 ee26 2214 7fff f903
0434260  0100 0000 d027 bffc f207 bffc 8090 0019 1280 0004 0100 0000 1080 0051 0100 0000 d007 bffc 7fff f90a 0100 0000 1100 012a
0434340  9012 22b0 7fff f963 0100 0000 1100 012a 9012 23b0 1300 0106 9212 617c 4000 5a09 0100 0000 8090 0008 1280 000e 0100 0000
0434420  1100 0129 d002 2208 9022 2001 1300 0129 d022 6208 d007 bffc 7fff f8f5 0100 0000 1100 012a 9012 22b0 7fff f34e 0100 0000
0434500  1500 012a d44a a3b0 9610 000a 8090 000b 0280 002b 0100 0000 1100 012a d04a 23b0 9210 0008 80a2 602b 1280 000d 0100 0000
0434560  9027 a108 d207 a044 4000 59d8 0100 0000 9027 a108 1300 012a 9212 63b1 7fff fef0 0100 0000 1080 000a 0100 0000 9027 a108
0434640  1300 012a 9212 63b0 4000 59cc 0100 0000 9027 a108 7fff fec2 0100 0000 9027 a108 7fff f8a6 0100 0000 d027 bff8 d007 bff8
0434720  7fff ff7d 0100 0000 d007 bffc 7fff f8c8 0100 0000 1100 012a 9012 22b0 7fff f921 0100 0000 10bf ffd3 0100 0000 d007 bffc
0435000  4000 59da 0100 0000 9010 2000 b010 0008 81c7 e008 81e8 0000 033f ffff 8200 63a0 9de3 8001 1100 0106 9012 2181 1300 0129
0435060  1202 6210 7fff f873 0100 0000 9010 2000 b010 0008 81c7 e008 81e8 0000 033f ffff 8200 63a0 9de3 8001 f027 a044 d007 a044
0435140  d24a 0000 9410 0009 8090 000a 1280 0004 0100 0000 7fff ffe9 0100 0000 d007 a044 7fff f876 0100 0000 1080 0003 0100 0000
0435220  9010 2000 b010 0008 81c7 e008 81e8 0000 033f ffff 8200 6398 9de3 8001 9010 2001 1300 0129 d022 620c c027 bffc d407 bffc
0435300  972a a002 1900 0101 9813 234c da02 c00c 8090 000d 0280 000e 0100 0000 de07 bffc a12b e002 2300 0101 a214 634c d004 0011
0435360  4000 0074 0100 0000 e407 bffc a404 a001 e427 bffc 10bf ffee 0100 0000 2700 0129 c024 e20c 1100 0106 9012 219d 4000 0006
0435440  0100 0000 9010 2000 b010 0008 81c7 e008 81e8 0000 033f ffff 8200 6398 9de3 8001 f027 a044 1100 012a 9012 20b0 d207 a044
0435520  4000 5962 0100 0000 9010 2000 7fff fc5d 0100 0000 d027 bffc d007 bffc 8090 0008 1280 0004 0100 0000 1080 0016 0100 0000
0435600  d007 bffc 7fff f85e 0100 0000 d027 bff8 1100 012a 9012 22b0 7fff 97f2 0100 0000 1100 012a 9012 22b0 4000 0046 0100 0000
0435660  d007 bff8 8090 0008 12bf fff2 0100 0000 d007 bffc 4000 5969 0100 0000 9010 2000 b010 0008 81c7 e008 81e8 0000 033f ffff
0435740  8200 6398 9de3 8001 f027 a044 9027 a004 1300 0129 d202 6204 d407 a044 9610 2000 7fff d177 0100 0000 8090 0008 0280 0005
0436020  0100 0000 d007 bffc 1080 0027 0100 0000 9010 2014 1300 0129 d202 6200 4000 02b9 0100 0000 d027 bffc d007 a044 7fff ff84
0436100  0100 0000 d027 a044 d007 bffc d207 a044 1222 2004 d407 bffc c022 a008 d607 bffc c022 e00c d807 bffc c023 2010 d007 bffc
0436160  1300 0129 d202 6204 d407 a044 9610 2000 7fff d144 0100 0000 da07 bffc 1f00 0129 de03 e1f8 de23 4000 e007 bffc 2300 0129
0436240  e024 61f8 d007 bffc 1080 0003 0100 0000 9010 2000 b010 0008 81c7 e008 81e8 0000 033f ffff 8200 63a0 9de3 8001 f027 a044
0436320  d007 a044 1300 0129 d022 6218 d407 a044 d64a 8000 9810 000b 80a3 2020 0280 0008 0100 0000 da07 a044 de4b 4000 a010 000f
0436400  80a4 2009 1280 0007 0100 0000 e207 a044 a204 6001 e227 a044 10bf fff1 0100 0000 e407 a044 e64c 8000 a810 0013 8090 0014
0436460  0280 0013 0100 0000 ea07 a044 ec4d 4000 ae10 0016 80a5 e02a 0280 000d 0100 0000 f007 a044 f24e 0000 b410 0019 80a6 a023
0436540  0280 0009 0100 0000 3700 0129 f606 e20c 8090 001b 1280 0004 0100 0000 1080 0047 0100 0000 f807 a044 fa4f 0000 9010 001d
0436620  80a2 2023 1280 0027 0100 0000 1100 0129 c022 21fc 1300 0129 c022 620c d407 a044 9402 a001 d427 a044 d007 a044 7fff f82d
0436700  0100 0000 d027 a044 1100 012a d04a 23b0 9210 0008 8090 0009 1280 0004 0100 0000 1080 0012 0100 0000 1100 012a 9012 23b0
0436760  1300 0106 9212 61a5 4000 58ca 0100 0000 9090 0008 1280 0007 0100 0000 9010 2001 1300 0129 d022 620c 1080 0004 0100 0000
0437040  10bf ffe6 0100 0000 1080 001b 0100 0000 d407 a044 d64a 8000 9810 000b 80a3 2021 1280 0007 0100 0000 d007 a044 4000 0016
0437120  0100 0000 1080 0010 0100 0000 d007 a044 d24a 0000 9410 0009 80a2 a03d 1280 0007 0100 0000 d007 a044 4000 003c 0100 0000
0437200  1080 0005 0100 0000 d007 a044 4000 006d 0100 0000 9010 2000 b010 0008 81c7 e008 81e8 0000 033f ffff 8200 6298 9de3 8001
0437260  f027 a044 d007 a044 9002 2001 d027 a044 d007 a044 7fff f7eb 0100 0000 d027 a044 d007 a044 7fff 9752 0100 0000 9210 2021
0437340  d22f befc 9027 a103 1300 012a 9212 63b0 4000 587a 0100 0000 9027 a104 7fff ff38 0100 0000 d027 bffc d007 a044 7fff f7d9
0437420  0100 0000 d027 a044 1100 012a 9012 23b0 7fff fecb 0100 0000 d407 bffc d022 a008 d007 a044 7fff f7cf 0100 0000 d027 a044
0437500  1100 012a 9012 23b0 7fff fec1 0100 0000 d607 bffc d022 e00c 9010 2000 b010 0008 81c7 e008 81e8 0000 033f ffff 8200 6398
0437560  9de3 8001 f027 a044 1100 0129 d002 21fc 9090 0008 1280 0004 0100 0000 7fff fea3 0100 0000 d207 a044 9202 6001 d227 a044
0437640  d007 a044 7fff f7b3 0100 0000 d027 a044 1500 012a d44a a3b0 9610 000a 8090 000b 0280 001c 0100 0000 1100 012a 9012 23b0
0437720  7fff ff03 0100 0000 d027 bffc d007 bffc 1300 0129 d202 61fc d402 6010 d422 2010 d607 bffc 1900 0129 d803 21fc da03 2008
0440000  da22 e008 de07 bffc 2100 0129 e004 21fc e204 200c e223 e00c d007 a044 7fff f795 0100 0000 d027 a044 10bf ffe2 0100 0000
0440060  9010 2000 b010 0008 81c7 e008 81e8 0000 033f ffff 8200 6398 9de3 8001 f027 a044 d007 a044 7fff f787 0100 0000 d027 a044
0440140  1100 012a 9012 23b0 7fff fedd 0100 0000 d027 bffc d007 a044 7fff f77e 0100 0000 d027 a044 1100 012a d04a 23b0 d02f bffb
0440220  d24f bffb 9410 0009 80a2 a02b 1280 0008 0100 0000 d607 bffc 1900 0106 9813 21aa d822 e008 1080 000f 0100 0000 da4f bffb
0440300  9e10 000d 80a3 e023 1280 0008 0100 0000 e007 bffc 2300 0106 a214 61ac e224 2008 1080 0004 0100 0000 7fff fe4c 0100 0000
0440360  a410 2021 2700 012a e42c e3b0 1100 012a 9012 23b0 7fff feb6 0100 0000 e807 bffc d025 2010 d007 a044 7fff f756 0100 0000
0440440  d027 a044 1100 012a 9012 23b0 7fff fe48 0100 0000 ea07 bffc d025 600c ec07 bffc 2f00 0129 ec25 e1fc 9010 2000 b010 0008
0440520  81c7 e008 81e8 0000 033f ffff 9200 63a0 9de3 8001 f027 a044 f227 a048 f427 a04c d007 a044 7fff f73f 0100 0000 d027 a044
0440600  d007 a04c d202 0000 8090 0009 0280 0005 0100 0000 d007 a044 1080 001a 0100 0000 1500 012a d44a a3b0 9610 000a 8090 000b
0440660  0280 000b 0100 0000 1100 012a 9012 23b0 7fff f6a6 0100 0000 d207 a04c d022 4000 d007 a044 1080 000b 0100 0000 d007 a048
```

133

134

```
0440740 4000 5833 0100 0000 d407 a04c d022 8000 1007 a044 1080 0003 0100 0000 9010 2000 b010 0008 81c7 e008 81e8 0000 033f ffff
0441020 8200 6390 9de3 8001 1100 012a 9012 20b0 1300 0106 9212 61ae 4000 57ac 0100 0000 9010 2000 7fff faa7 0100 0000 d027 bffc
0441100 d007 bffc 8090 0008 0280 000a 0100 0000 d007 bffc 7fff f6aa 0100 0000 d007 bffc 4000 57c2 0100 0000 1080 0004 0100 0000
0441160 1100 012a c02a 22b0 c027 bff0 1300 012a 9212 62b0 d227 bff4 d007 bff4 1300 0106 9212 61bc 1500 0102 9412 a1d8 7fff ffaf
0441240 0100 0000 d027 bff4 1500 0102 d402 a1d8 8090 000a 1280 0009 0100 0000 1100 0106 9012 21c0 4000 57a6 0100 0000 9010 200c
0441320 4000 5767 0100 0000 d007 bff4 7fff f6e5 0100 0000 d027 bff4 d007 bff4 1300 0106 9212 61e7 1500 0102 9412 a1dc 7fff ff97
0441400 0100 0000 d027 bff4 d007 bff4 1300 0106 9212 61ec 1500 0102 9412 a1e0 7fff ff8f 0100 0000 d027 bff4 d007 bff4 1300 0106
0441460 9212 61f0 1500 0102 9412 a1e4 7fff ff87 0100 0000 d027 bff4 9427 a010 1300 0106 9212 61f5 d007 bff4 7fff ff80 0100 0000
0441540 d027 bff4 1100 0102 d002 21e8 8090 0008 1280 0035 0100 0000 1100 0106 9012 21fb 1300 0102 d022 61e8 d407 bff0 8090 000a
0441620 0280 002d 0100 0000 d007 bff0 d24a 2001 9410 0009 80a2 a059 1280 0024 0100 0000 d007 bff0 d24a 2002 9410 0009 d427 bff8
0441700 1080 0014 0100 0000 1100 0106 9012 21ff 1300 0102 d022 61e8 1080 0016 0100 0000 1500 0106 9412 a205 1700 0102 d422 e1e8
0441760 1080 0010 0100 0000 1900 0106 9813 220b 1b00 0102 d823 61e8 1080 000a 0100 0000 d007 bff8 80a2 2043 02bf ffec 80a2 2049
0442040 02bf fff6 80a2 2043 02bf ffee 0100 0000 1080 c005 0100 0000 d007 bff0 1300 0102 d022 61e8 1500 0102 c022 a1ec 1700 0102
0442120 c022 e1f4 1900 0102 c023 21f8 1b00 0102 c023 61f0 1f00 0102 de03 e1e0 8090 000f 0280 0032 0100 0000 1100 0102 d002 21e0
0442200 1300 0106 9212 6211 4000 5726 0100 0000 8090 0008 0280 000b 0100 0000 1100 0102 d002 21e0 1300 0106 9212 6217 4000 571d
0442260 0100 0000 8090 0008 1280 0020 0100 0000 1100 0102 d002 21e0 1300 0102 d022 61ec 1500 0102 c022 a1e0 d007 bff4 1300 0106
0442340 9212 6220 1500 0102 9412 a1f4 7fff ff1b 0100 0000 d027 bff4 d007 bff4 1300 0106 9212 6226 1500 0102 9412 a1f8 7fff ff13
0442420 0100 0000 d027 bff4 d007 bff4 1300 0106 9212 622c 1500 0102 9412 a1f0 7fff ff0b 0100 0000 d027 bff4 9010 2000 b010 0008
0442500 81c7 e008 81e8 0000 033f ffff 8200 63a0 9de3 8001 f027 a044 f227 a048 d007 a044 80a2 2013 1280 000f 0100 0000 1300 0106
0442560 d202 6340 8090 0009 0280 000a 0100 0000 0300 0106 c200 6340 9fc0 4000 0100 0000 1500 010c d022 a29c 1080 0006 0100 0000
0442640 d007 a044 d207 a048 4000 1dcd 0100 0000 9010 2000 b010 0008 81c7 e008 81e8 0000 033f ffff 8200 63a0 9de3 8001 f027 a044
0442720 1100 0106 d002 2334 8090 0008 1280 0009 0100 0000 1100 0099 9012 2148 4000 1d47 0100 0000 9010 2001 1300 0106 d022 6334
0443000 9010 2000 d207 a044 4000 1fc4 0100 0000 1500 010c d402 a2a0 1700 0106 d422 e338 4000 1f9c 0100 0000 1080 0003 0100 0000
0443060 9010 2000 b010 0008 81c7 e008 81e8 0000 033f ffff 8200 63a0 9de3 8001 f027 a044 d007 a044 4000 2280 0100 0000 1300 0106
0443140 d202 633c 9222 4008 1500 0106 d222 a33c d007 a044 4000 1f6b 0100 0000 4000 203d 0100 0000 9010 2000 b010 0008 81c7 e008
0443220 81e8 0000 033f ffff 8200 6398 9de3 8001 f027 a044 f227 a048 d007 a048 4000 1f5d 0100 0000 d007 a044 4000 20a0 0100 0000
0443300 d027 bffc 4000 1f73 0100 0000 d007 a044 1300 0106 d202 633c 9202 4008 1500 0106 d222 a33c 1700 010c d602 e2a0 1900 0106
0443360 d623 2338 d007 bffc 1080 0003 0100 0000 9010 2000 b010 0008 81c7 e008 81e8 0000 033f ffff 8200 6398 9de3 8001 f027 a044
0443440 f227 a048 d007 a048 4000 1f3e 0100 0000 d007 a044 4000 20ab 0100 0000 d027 bffc 4000 1f54 0100 0000 d007 a044 1300 0106
0443520 d202 633c 9202 4008 1500 0106 d222 a33c 1700 010c d602 e2a0 1900 0106 d623 2338 d007 bffc 1080 0003 0100 0000 9010 2000
0443600 b010 0008 81c7 e008 81e8 0000 033f ffff 8200 63c0 9de3 8001 4000 215b 0100 0000 9010 2000 b010 0008 81c7 e008 81e8 0000
0443660 033f ffff 8200 6378 9de3 8001 f027 a044 f227 a048 f427 a04c d007 a048 932a 2003 d407 a044 9602 8009 d627 bff0 9810 2001
0443740 d827 bff4 c027 bff8 da07 bff4 de07 a048 80a3 400f 1680 000a 0100 0000 e007 bff4 a12c 2001 e027 bff4 e207 bff8 a204 6001
0444020 e227 bff8 10bf fff5 0100 0000 e407 bff8 9090 0012 0280 0061 0100 0000 d007 bff4 d027 bffc d207 bffc 80a2 6001 0280 0056
0444100 0100 0000 d007 a044 d027 bfec d207 bfec 1407 bff0 80a2 400a 1a80 004a 0100 0000 d007 bffc 932a 2003 d407 bfec 9602 8009
0444160 d627 bfe8 d807 bfe8 da07 bff0 80a3 000d 0880 0005 0100 0000 de07 bff0 1080 0003 0100 0000 de07 bfe8 a023 e008 e027 bfe0
0444240 e207 bfe8 a424 6008 e607 bfe0 a824 8013 ab3d 2003 ad2d 6003 ee07 bfec b005 c016 f027 bfe4 f207 bfe4 f407 bfe0 80a6 401a
0444320 1a80 0028 0100 0000 c207 a04c d007 bfe0 d002 0000 d207 bfe4 d202 4000 9fc0 4000 0100 0000 8090 0008 0280 0016 0100 0000
0444400 d007 bfe0 d202 0000 d227 bfdc d407 bfe0 d607 bfe4 d802 c000 d822 8000 da07 bfe4 de07 bfdc de23 4000 e007 bfe0 e204 2004
0444460 e227 bfdc e407 bfe0 e607 bfe4 e804 e004 e824 a004 ea07 bfe4 ec07 bfdc ec25 6004 ee07 bfe4 ae05 e008 ee27 bfe4 f007 bfe0
0444540 b026 2008 f027 bfe0 10bf ffd7 0100 0000 f207 bfe8 f227 bfec 10bf ffb5 0100 0000 f407 bffc b53e a001 f427 bffc 10bf ffaa
0444620 0100 0000 f607 bff8 b626 e001 f627 bff8 10bf ff9f 0100 0000 9010 2000 b010 0008 81c7 e008 81e8 0000 033f ffff 8200 6390
0444700 9de3 8001 f027 a044 f227 a048 d007 a048 932a 2003 d407 a044 9602 8009 d627 bff0 9810 2001 d827 bff4 c027 bff8 da07 bff4
0444760 de07 a048 80a3 400f 1680 000a 0100 0000 e007 bff4 a12c 2001 e027 bff4 e207 bff8 a204 6001 e227 bff8 10bf fff5 0100 0000
0445040 e407 bff8 8090 0012 0280 0079 0100 0000 d007 bff4 d027 bffc d207 bffc 80a2 6001 0280 006e 0100 0000 d007 a044 d027 bfec
0445120 d207 bfec d407 bff0 80a2 400a 1a80 0062 0100 0000 d007 bffc 932a 2003 d407 bfec 9602 8009 d627 bfe8 d807 bfe8 da07 bff0
0445200 80a3 000d 0880 0005 0100 0000 de07 bff0 1080 0003 0100 0000 de07 bfe8 a023 e008 e027 bfe0 e207 bfe8 a424 6008 e607 bfe0
0445260 a824 8013 ab3d 2003 ad2d 6003 ee07 bfec b005 c016 f027 bfe4 f207 bfe4 f407 bfe0 80a6 401a 1a80 0040 0100 0000 d007 bfe0
0445340 d202 0000 d227 bfd8 d407 bfe4 d602 8000 d627 bfd4 d807 bfd4 da4b 0000 de07 bfd8 e04b c000 80a4 000d 1280 0010 0100 0000
0445420 e207 bfd8 e44c 4000 a610 0012 8090 0013 0280 000a 0100 0000 e807 bfd8 a805 2001 e827 bfd8 ea07 bfd4 aa05 6001 ea27 bfd4
0445500 10bf ffcd 0100 0000 ec07 bfd4 ee4d 8000 f007 bfd8 f24e 0000 80a6 4017 1680 0016 0100 0000 d007 bfe0 d202 0000 d227 bfdc
0445560 d407 bfe0 d607 bfe4 d802 c000 d822 8000 da07 bfe4 de07 bfdc de23 4000 e007 bfe0 e204 2004 e227 bfdc e407 bfe0 e607 bfe4
0445640 e804 e004 e824 a004 ea07 bfe4 ec07 bfdc ec25 6004 ee07 bfe4 ae05 e008 ee27 bfe4 f007 bfe0 b026 2008 f027 bfe0 10bf ffbf
0445720 0100 0000 f207 bfe8 f227 bfec 10bf ff9d 0100 0000 f407 bffc b53e a001 f427 bffc 10bf ff92 0100 0000 f607 bff8 b626 e001
0446000 f627 bff8 10bf ff87 0100 0000 9010 2000 b010 0008 81c7 e008 81e8 0000 033f ffff 8200 63c0 9de3 8001 f027 a044 f227 a048
```

```
0446060 f427 a04c 1100 012b d002 22c0 9002 2001 1300 012b d022 62c0 9010 2000 b010 0008 81c7 e008 81e8 0000 033f ffff 8200 6398
0446140 9de3 8001 f027 a044 f227 a048 f427 a04c 1100 012b d002 22c4 932a 2003 1500 012b d402 a2d0 9602 8009 d807 a044 d822 e004
0446220 1b00 012b da03 62d4 8090 000d 0280 001f 0100 0000 d007 a04c 9002 2001 1300 012b d202 62d8 7fff fe97 0100 0000 d027 bffc
0446300 c027 bff8 d007 bff8 d207 a04c 80a2 0009 1680 000d 0100 0000 d407 bffc d607 bff8 d807 a048 da07 bff8 de4b 000d de2a 800b
0446360 e007 bff8 a004 2001 e027 bff8 10bf fff2 0100 0000 e207 bffc e407 bff8 c02c 4012 1080 0004 0100 0000 d007 a048 d027 bffc
0446440 1300 012b d202 62c4 952a 6003 1700 012b d602 e2d0 d807 bffc d822 c00a 1b00 012b da03 62c4 9a03 6001 1f00 012b da23 e2c4
0446520 9010 2000 b010 0008 81c7 e008 81e8 0000 033f ffff 8200 63a0 9de3 8001 f027 a044 f227 a048 f427 a04c 1100 012b c022 22c0
0446600 d007 a044 1300 009b 9212 601c 7fff cd38 0100 0000 1100 012b d002 22c0 9002 2001 912a 2003 d207 a048 7fff fe5a 0100 0000
0446660 1300 012b d022 62d0 d407 a04c 1700 012b d422 e2d4 1900 012b c023 22c4 da07 a048 1f00 012b da23 e2d8 d007 a044 1300 009b
0446740 9212 6058 7fff cd22 0100 0000 2100 012b e004 22c0 a32c 2003 2500 012b e404 a2d0 c024 8011 1100 012b d002 22d0 1300 012b
0447020 d202 62c0 7fff fee9 0100 0000 1100 012b d002 22d0 1080 0003 0100 0000 9010 2000 b010 0008 81c7 e008 81e8 0000 033f ffff
0447100 8200 6388 9de3 8001 f027 a044 f227 a048 d007 a048 80a2 2001 1480 0005 0100 0000 d007 a044 1080 0090 0100 0000 d207 a048
0447160 953a 6001 d427 bff8 d607 a044 d627 bff4 d807 bff8 9a23 2001 da27 bffc de07 bffc 8090 000f 0480 000c 0100 0000 e007 bff4
0447240 2300 012b e204 62c8 e404 0011 e427 bff4 e607 bffc a624 e001 e627 bffc 10bf fff4 0100 0000 e807 bff4 2b00 012b ea05 62c8
0447320 ec05 0015 ec27 bfec ee07 bff4 3100 012b f006 22c8 c025 c018 d007 a044 d207 bff8 7fff ffd3 0100 0000 d027 bff0 d207 a048
0447400 f207 bff8 9222 4019 d007 bfec 7fff ffcc 0100 0000 d027 bfec 0300 012b c200 62dc f407 bfec 3700 012b f606 e2cc d006 801b
0447460 f807 bff0 3b00 012b fa07 62cc d207 001d 9fc0 4000 0100 0000 8090 0008 0280 000b 0100 0000 d007 bfec d027 bfe8 d207 bfec
0447540 1500 012b d402 a2c8 d602 400a d627 bfec 1080 0009 0100 0000 d007 bff0 d027 bfe8 d207 bff0 1500 012b d402 a2c8 d602 400a
0447620 d627 bff0 d807 bfe8 1b00 012b da03 62c8 9e03 000d de27 bff4 e007 bff0 8090 0010 0280 002f 0100 0000 e207 bfec 8090 0011
0447700 0280 002b 0100 0000 0300 012b c200 62dc d007 bfec 1300 012b d202 62cc d002 0009 d407 bff0 1700 012b d602 e2cc d202 800b
0447760 9fc0 4000 010c 0000 8090 0008 0280 000c 0100 0000 d007 bff4 d207 bfec d222 0000 d407 bfec 1700 012b d602 e2c8 d802 800b
0450040 d827 bfec 1080 000a 0100 0000 d007 bff4 d207 bff0 d222 0000 d407 bff0 1700 012b d602 e2c8 d802 800b d827 bff0 da07 bff4
0450120 de03 4000 2100 012b e004 22c8 a203 c010 e227 bff4 10bf ffd1 0100 0000 e407 bff0 8090 0012 1280 0005 0100 0000 e607 bfec
0450200 1080 0003 0100 0000 e607 bff0 e807 bff4 e625 0000 d007 bfe8 1080 0003 0100 0000 9010 2000 b010 0008 81c7 e008 81e8 0000
0450260 033f ffff 8200 6388 9de3 8001 f027 a044 f227 a048 d007 a048 80a2 2001 1480 0005 0100 0000 d007 a044 1080 0084 0100 0000
0450340 d207 a048 953a 6001 d427 bff8 d607 a044 d627 bff4 d807 bff8 9a23 2001 da27 bffc de07 bffc 8090 000f 0480 000c 0100 0000
0450420 e007 bff4 2300 012b e204 62c8 e404 0011 e427 bff4 e607 bffc a624 e001 e627 bffc 10bf fff4 0100 0000 e807 bff4 2b00 012b
0450500 ea05 62c8 ec05 0015 ec27 bfec ee07 bff4 3100 012b f006 22c8 c025 c018 d007 a044 d207 bff8 7fff ffd3 0100 0000 d027 bff0
0450560 d207 a048 f207 bff8 9222 4019 d007 bfec 7fff ffcc 0100 0000 d027 bfec 0300 012b c200 62dc d007 bfec d207 bff0 9fc0 4000
0450640 0100 0000 8090 0008 0280 000b 0100 0000 d007 bfec d027 bfe8 d207 bfec 1500 012b d402 a2c8 d602 400a d627 bfec 1080 0009
0450720 0100 0000 d007 bff0 d027 bfe8 d207 bff0 1500 012b d402 a2c8 d602 400a d627 bff0 d807 bfe8 1b00 012b da03 62c8 9e03 000d
0451000 de27 bff4 e007 bff0 8090 0010 0280 0029 0100 0000 e207 bfec 8090 0011 0280 0025 0100 0000 0300 012b c200 62dc d007 bfec
0451060 d207 bff0 9fc0 4000 0100 0000 8090 0008 0280 000c 0100 0000 d007 bff4 d207 bfec d222 0000 d407 bfec 1700 012b d602 e2c8
0451140 d802 800b d827 bfec 1080 000a 0100 0000 d007 bff4 d207 bff0 d222 0000 d407 bff0 1700 012b d602 e2c8 d802 800b d827 bff0
0451220 da07 bff4 de03 4000 2100 012b e004 22c8 a203 c010 e227 bff4 10bf ffd7 0100 0000 e407 bff0 8090 0012 1280 0005 0100 0000
0451300 e607 bfec 1080 0003 0100 0000 e607 bff0 e807 bff4 e625 0000 d007 bfe8 1080 0003 0100 0000 9010 2000 b010 0008 81c7 e008
0451360 81e8 0000 033f ffff 8200 6398 9de3 8001 f027 a044 f227 a048 f427 a04c f627 a050 d007 a048 d207 a044 9422 0009 1700 012b
0451440 d422 e2c8 d807 a04c da07 a044 9e23 000d 2100 012b de24 22cc e207 a050 2500 012b e224 a2dc e607 a044 e627 bff8 c027 bffc
0451520 e807 bff8 8090 0014 0280 000c 0100 0000 ea07 bff8 2d00 012b ec05 a2c8 ee05 4016 ee27 bff8 f007 bffc b006 2001 f027 bffc
0451600 10bf fff4 0100 0000 f207 a04c 8090 0019 1280 0008 0100 0000 d007 a044 d207 bffc 7fff ff44 0100 0000 1080 0009 0100 0000
0451660 d007 a044 d207 bffc 7fff fea1 0100 0000 1080 0003 0100 0000 9010 2000 b010 0008 81c7 e008 81e8 0000 033f ffff 8200 63a0
0451740 9de3 8001 f22f a04b d006 2004 d202 2014 9090 0009 0280 000a 0100 0000 9010 0018 4000 5321 0100 0000 8090 0008 1280 0004
0452020 0100 0000 1080 0043 0100 0000 d006 2004 d202 2308 d402 6010 d606 2004 d802 e008 da03 200c 80a3 400a 0a80 0014 0100 0000
0452100 de06 2004 e003 e008 e204 2024 c204 6014 e406 2004 e604 a008 e804 e024 ea55 2010 ac10 0015 ee06 2004 d005 e008 9002 0016
0452160 d24f a04b 920a 60ff 9fc0 4000 0100 0000 1090 000d 0100 0000 f206 2004 f406 6008 f606 a00c b606 e001 f626 a00c b826 e001
0452240 d04f a04b 912a 2018 913a 2018 d02f 0000 900a 20ff 80a2 3fff 1280 000e 0100 0000 d006 2004 d202 200c 9212 6003 d222 200c
0452320 d406 2004 d602 a010 9612 e003 d622 a010 d806 2004 da03 2010 9a13 6003 da23 2010 de06 2004 e003 e01c 8090 0010 0280 0008
0452400 0100 0000 9010 0018 4000 52e2 0100 0000 a210 2000 1080 0003 0100 0000 a210 2000 9010 0018 1080 0003 0100 0000 9010 2000
0452460 b010 0008 81c7 e008 81e8 0000 033f ffff 8200 63a0 9de3 8001 8090 0018 1280 0009 0100 0000 9010 203c 4000 52d1 0100 0000
0452540 b010 0008 8090 0008 0280 0042 0100 0000 9010 0018 9210 2000 7fff 92db 0100 0000 b010 0008 1100 0107 d002 208c d026 0000
0452620 9206 2024 8090 0009 1280 0008 0100 0000 9010 200c 4000 52be 0100 0000 8090 0008 0280 000a 0100 0000 1500 0107 d402 a0fc
0452700 d426 202c c026 2028 c026 2024 9610 2000 1090 0003 0100 0000 9610 2000 9806 2024 1b00 0107 da03 60f8 da26 202c 9e06 2024
0452760 a006 2030 8090 0010 1280 0008 0100 0000 9010 200c 4000 52a6 0100 0000 8090 0008 0280 000a 0100 0000 2300 0107 e204 60fc
0453040 e226 2038 c026 2034 c026 2030 a410 2000 1080 0003 0100 0000 a410 2000 a606 2030 2900 0107 e805 20f8 e826 2038 aa06 2030
0453120 c026 2008 c026 200c c026 2010 c026 2018 c026 201c c026 2020 ac10 3fff ec26 2014 9010 0018 1080 0003 0100 0000 9010 2000
```

```
0453200  b010 0008 81c7 e008 81e8 0000 033f ffff 8200 6398 9de3 8001 9010 2001 d026 201c d006 2018 1300 0107 9212 6128 4000 529d
0453260  0100 0000 8090 0008 1280 0006 0100 0000 9210 2004 d226 2020 1080 0032 0100 0000 d006 2018 1300 0107 9212 612c 4000 5291
0453340  0100 0000 8090 0008 1280 0006 0100 0000 9410 2003 d426 2020 1080 0026 0100 0000 d006 2018 1300 0107 9212 6130 4000 5285
0453420  0100 0000 8090 0008 1280 0006 0100 0000 9610 2002 d626 2020 1080 001a 0100 0000 d006 2018 1300 0107 9212 6134 4000 5279
0453500  0100 0000 8090 0008 1280 0006 0100 0000 9810 2001 d826 2020 1080 000e 0100 0000 1100 0008 9012 2328 9210 2053 1500 0107
0453560  9412 a138 d606 2018 7fff 90d2 0100 0000 9010 2001 d027 bffc d207 bffc d226 2004 9010 2000 b010 0008 81c7 e008 81e8 0000
0453640  033f ffff 8200 6398 9de3 8001 f227 a048 d007 a048 d027 bffc d007 bffc 1300 0109 d202 62a8 7fff 796d 0100 0000 7fff 8f98
0453720  0100 0000 d026 2024 d007 bffc 7fff 79ee 0100 0000 d026 2028 d206 2028 80a2 6001 0680 0006 0100 0000 d406 2028 80a2 a040
0454000  0480 000e 0100 0300 1100 0008 9012 232a 9210 2053 1500 0107 9412 a14c d606 2028 7fff 90a8 0100 0000 9010 2001 d027 bff8
0454060  d207 bff8 d226 2004 d406 2028 d426 0000 9010 0018 1300 0107 9212 6162 1500 0107 9412 a164 4000 1123 0100 0000 9010 0018
0454140  1300 0107 9212 6166 1500 0107 9412 a168 4000 111c 0100 0000 9010 0018 1300 0107 9212 616a 1500 0107 9412 a16c 4000 1115
0454220  0100 0000 9010 0018 1300 0107 9212 616f 1500 0107 9412 a172 4000 110e 0100 0000 9010 0018 1300 0107 9212 6174 1500 0107
0454300  9412 a176 4000 1107 0100 0000 9010 2000 b010 0008 81c7 e008 81e8 0000 033f ffff 8200 63a0 9de3 8001 f227 a048 d007 a048
0454360  c02a 0000 1100 00f5 d002 2358 4000 1021 0100 0000 9810 0008 d206 2028 d223 a05c d007 a048 1300 0107 9212 6178 d406 201c
0454440  d606 2020 da06 2024 4000 51e3 0100 0000 d007 a048 1080 0003 0100 0000 9010 2000 b010 0008 81c7 e008 81e8 0000 033f ffff
0454520  8200 63a0 9de3 8001 1100 012b 9012 22e0 4000 51e1 0100 0000 9010 2000 b010 0008 81c7 e008 81e8 0000 033f ffff 8200 63a0
0454600  9de3 8001 1100 012b 9012 22e0 9210 2002 4000 51d8 0100 0000 9010 2000 b010 0008 81c7 e008 81e8 0000 033f ffff 8200 63a0
0454660  9de3 8001 f027 a044 f227 a048 d007 a048 7fff 8f1b 0100 0000 d207 a044 d022 6018 d407 a044 d602 a014 c202 e00c d807 a044
0454740  da03 2014 de53 6008 a010 000f d007 a044 9002 0010 9fc0 4000 0100 0000 9010 2000 b010 0008 81c7 e008 81e8 0000 033f ffff
0455020  8200 63a0 9de3 8001 f227 a048 d007 a048 7fff 8f03 0100 0000 d026 2008 9010 0018 d206 2008 7fff 91f0 0100 0000 9010 2000
0455100  b010 0008 81c7 e008 81e8 0000 033f ffff 8200 63a0 9de3 8001 f227 a048 1100 0000 9012 2000 d207 a048 4000 51a5 0100 0000
0455160  d206 2008 4000 51a2 0100 0000 1300 0107 9212 618b 4000 519e 0100 0000 9006 200c 1300 0107 9212 618d 7fff 6cc1 0100 0000
0455240  9010 2000 b010 0008 81c7 e008 81e8 0000 033f ffff 8200 63a0 9de3 8001 f227 a048 9006 202c d207 a048 9410 2001 7fff 6d0c
0455320  0100 0000 9010 2000 b010 0008 81c7 e008 81e8 0000 033f ffff 8200 63a0 9de3 8001 f227 a048 1100 0000 9012 2000 d207 a048
0455400  4000 517f 0100 0000 1300 0107 9212 618f 4000 517b 0100 0000 d006 2008 d202 0000 c202 600c d406 2008 d602 8000 d852 e008
0455460  9a10 000c d006 2008 9002 000d 1300 0107 9212 6191 9fc0 4000 0100 0000 9010 2000 b010 0008 81c7 e008 81e8 0000 033f ffff
0455540  8200 63c0 9de3 8001 f027 a044 f227 a048 9010 3fff 1080 0003 0100 0000 9010 2000 b010 0008 81c7 e008 81e8 0000 033f ffff
*
0455700  8200 63c0 9de3 8001 f027 a044 f227 a048 f427 a04c f627 a050 9010 2000 b010 0008 81c7 e008 81e8 0000 033f ffff 8200 63c0
0455760  9de3 8001 f027 a044 f227 a048 f427 a04c 9010 2000 b010 0008 81c7 e008 81e8 0000 033f ffff 8200 63c0 9de3 8001 f027 a044
0456040  f227 a048 f427 a04c 9010 2000 b010 0008 81c7 e008 81e8 0000 033f ffff 8200 63c0 9de3 8001 f027 a044 f227 a048 f427 a04c
0456120  9010 2000 1080 0003 0100 0000 9010 2000 b010 0008 81c7 e008 81e8 0000 033f ffff 8200 63c0 9de3 8001 f027 a044 f227 a048
*
0456260  9010 3fff 1080 0003 0100 0000 9010 2000 b010 0008 81c7 e008 81e8 0000 0000 0000 033f ffff 8200 63a0 9de3 8001 f22f a04b
0456340  d006 2004 d202 2014 8090 0009 0280 000a 0100 0000 9010 0018 4000 50c3 0100 0000 8090 0008 1280 0004 0100 0000 1080 0043
0456420  0100 0000 d006 2004 d202 2008 d402 6010 d606 2004 d802 e008 da03 200c 80a3 400a 0a80 0014 0100 0000 de06 2004 e003 e008
0456500  e204 2024 c204 6014 e406 2004 e604 a008 e804 e024 ea55 2010 ac10 0015 ee06 2004 d005 e008 9002 0016 d24f a04b 920a 60ff
0456560  9fc0 4000 0100 0000 1080 000d 0100 0000 f206 2004 f406 6008 f606 a00c b606 e001 f626 a00c b826 e001 d04f a04b 912a 2018
0456640  913a 2018 d02f 0000 900a 20ff 80a2 3fff 1280 000e 0100 0000 d006 2004 d202 200c 9212 6003 d222 200c d406 2004 d602 a010
0456720  9612 e003 d622 a010 d806 2004 da03 2010 9a13 6003 da23 2010 de06 2004 e003 e01c 8090 0010 0280 0008 0100 0000 9010 0018
0457000  4000 50a4 0100 0000 a210 2000 1080 0003 0100 0000 a210 2000 9010 0018 1080 0003 0100 0000 9010 2000 b010 0008 81c7 e008
0457060  81e8 0000 033f ffff 8200 63a0 9de3 8001 8090 0018 1280 0009 0100 0000 9010 203c 4000 5093 0100 0000 b010 0008 8090 0008
0457140  0280 0042 0100 0000 9010 0018 9210 2000 7fff 909d 0100 0000 b010 0008 1100 0107 d002 21ec d026 0000 9206 2024 8090 0009
0457220  1280 0008 0100 0000 9010 200c 4000 5080 0100 0000 8090 0008 0280 000a 0100 0000 1500 0107 d402 a25c d426 202c c026 2028
0457300  c026 2024 9610 2000 1080 0003 0100 0000 9610 2000 9806 2024 1b00 0107 da03 6258 da26 202c 9e06 2024 a006 2030 8090 0010
0457360  1280 0008 0100 0000 9010 200c 4000 5068 0100 0000 8090 0008 0280 000a 0100 0000 2300 0107 e204 625c e226 2038 c026 2034
0457440  c026 2030 a410 2000 1080 0003 0100 0000 a410 2000 a606 2030 2900 0107 e805 2258 e826 2038 aa06 2030 c026 2008 c026 200c
0457520  c026 2010 c026 2018 c026 201c c026 2020 ac10 3fff ec26 2014 9010 0018 1080 0003 0100 0000 9010 2000 b010 0008 81c7 e008
0457600  81e8 0000 033f ffff 8200 63c0 9de3 8001 f027 a044 d007 a044 9210 2003 d222 201c d407 a044 c022 a020 9010 2000 b010 0008
0457660  81c7 e008 81e8 0000 033f ffff 8200 6378 9de3 8001 f227 a048 d007 a048 d027 bffc d007 bffc 1300 0109 d202 62a8 7fff 7767
0457740  0100 0000 7fff 8192 0100 0000 d026 2024 d207 bffc 9402 6080 d427 bff4 d607 bff4 d802 e008 c203 201c da07 bff4 de03 6008
0460020  e053 e018 a210 0010 d007 bff4 9002 0011 1300 0107 9212 6288 9fc0 4000 0100 0000 8090 0008 0280 0004 0100 0000 a410 2001
0460100  e426 2034 e607 bffc a804 e080 e827 bff0 ea07 bff0 ec05 6008 c205 a01c ee07 bff0 f205 e008 f456 6018 b610 001a d007 bff0
0460160  9002 001b 1300 0107 9212 6291 9fc0 4000 0100 0000 8090 0008 0280 0004 0100 0000 b810 2001 f826 2038 fa07 bffc 9007 6080
0460240  d027 bfec d207 bfec d402 6008 c202 a01c d607 bfec d802 e008 da53 2019 9e10 000d d007 bfec 9002 000f 1300 0107 9212 62a5
```

```
0460320 9fc0 4000 0100 0000 8090 0008 0280 0004 0100 0000 a010 2001 e026 203c e207 bffc a404 6068 e427 bfe8 e607 bfe8 e804 e008
0460400 c205 201c ea07 bfe8 ec05 6008 ee55 a018 b210 0017 d007 bfe8 9002 0019 1300 0107 9212 62b4 9fc0 4000 0100 0000 8090 0008
0460460 0280 0004 0100 0000 b410 2001 f426 202c f607 bffc b806 e068 f827 bfe4 fa07 bfe4 d007 4000 d027 bff8 d207 bff8 d406 202c
0460540 9622 400a 9822 e002 d826 2020 da06 2020 80a3 6002 0680 0006 0100 0000 de06 2020 80a3 e010 0480 000e 0100 0000 1100 0008
0460620 9012 232a 9210 2053 1500 0107 9412 a2b7 d606 2020 7fff 8e47 0100 0000 9010 2001 d027 bfe0 d207 bfe0 d226 2004 d007 bffc
0460700 7fff 7775 0100 0000 d026 2028 d406 2028 80a2 a001 0680 0006 0100 0000 d606 2028 80a2 e040 0480 000e 0100 0000 1100 0008
0460760 9012 232a 9210 2053 1500 0107 9412 a2cf d606 2028 7fff 8e2f 0100 0000 9010 2001 d027 bfe0 d207 bfe0 d226 2004 d407 bffc
0461040 9602 a068 d627 bfdc d807 bfdc da03 2008 c203 601c de07 bfdc e003 e008 e254 2018 a410 0011 d007 bfdc 9002 0012 1300 0107
0461120 9212 62e3 9fc0 4000 0100 0000 7fff 6f63 0100 0000 e606 2020 80a4 c008 0280 0004 0100 0000 a810 2001 e826 2030 ea06 2028
0461200 ea26 0000 9010 0018 1300 0107 9212 62e5 1500 0107 9412 a2e7 4000 0e92 0100 0000 9010 0018 1300 0107 9212 62e9 1500 0107
0461260 9412 a2ec 4000 0e8b 0100 0000 9010 0018 1300 0107 9212 62ee 1500 0107 9412 a2f1 4000 0e84 0100 0000 9010 0018 1300 0107
0461340 9212 62f3 1500 0107 9412 a2f6 4000 0e7d 0100 0000 9010 0018 1300 0107 9212 62f8 1500 0107 9412 a2fb 4000 0e76 0100 0000
0461420 9010 0018 1300 0107 9212 62fd 1500 0107 9412 a300 4000 0e6f 0100 0000 9010 0018 1300 0107 9212 6302 1500 0107 9412 a305
0461500 4000 0e68 0100 0000 9010 0018 1300 0107 9212 6307 1500 0107 9412 a30a 4000 0e61 0100 0000 9010 0018 1300 0107 9212 630c
0461560 1500 0107 9412 a30f 4000 0e5a 0100 0000 9010 0018 1300 0107 9212 6311 1500 0107 9412 a314 4000 0e53 0100 0000 9010 0018
0461640 1300 0107 9212 6316 1500 0107 9412 a319 4000 0e4c 0100 0000 9010 0018 1300 0107 9212 631b 1500 0107 9412 a31e 4000 0e45
0461720 0100 0000 9010 0018 1300 0107 9212 6320 1500 0107 9412 a324 4000 0e3e 0100 0000 9010 0018 1300 0107 9212 6326 1500 0107
0462000 9412 a32a 4000 0e37 0100 0000 9010 0018 1300 0107 9212 632c 1500 0107 9412 a330 4000 0e30 0100 0000 9010 0018 1300 0107
0462060 9212 6332 1500 0107 9412 a336 4000 0e29 0100 0000 9010 0018 1300 0107 9212 6338 1500 0107 9412 a33c 4000 0e22 0100 0000
0462140 9010 0018 1300 0107 9212 633e 1500 0107 9412 a342 4000 0e1b 0100 0000 ec06 2030 8090 0016 0280 000b 0100 0000 9010 0018
0462220 1300 0107 9212 6344 1500 0107 9412 a346 4000 0e10 0100 0000 1080 0009 0100 0000 9010 0018 1300 0107 9212 6348 1500 0107
0462300 9412 a34a 4000 0e07 0100 0000 9010 2000 b010 0008 81c7 e008 81e8 0000 033f ffff 8200 6388 9de3 8001 f227 a048 d007 a048
0462360 c52a 0000 1100 00f5 3002 2358 4000 0d21 0100 0000 ba10 0008 d006 2038 7fff 8e81 0100 0000 b810 0008 d006 202c 7fff 8e7d
0462440 0100 0000 b610 0008 d006 2030 7fff 8e79 0100 0000 d023 a068 d206 2034 8090 0009 1280 0005 0100 0000 9410 2001 1080 0003
0462520 0100 0000 9410 2000 d423 a06c d606 203c 8090 000b 0280 0006 0100 0000 1900 0107 9813 236e 1080 0004 0100 0000 1900 0107
0462600 9813 2370 d823 a070 da06 2028 da23 a05c f823 a060 f623 a064 d007 a048 1300 0107 9212 634c d406 201c d606 2020 da06 2024
0462660 9810 001d 4000 4ec0 0100 0000 d007 a048 1080 0003 0100 0000 9010 2000 b010 0008 81c7 e008 81e8 0000 033f ffff 8200 63a0
0462740 9de3 8001 1100 012b 9012 22e8 4000 4ebe 0100 0000 9010 2000 b010 0008 81c7 e008 81e8 0000 033f ffff 8200 63a0 9de3 8001
0463020 1100 012b 9012 22e8 9210 2002 4000 4eb5 0100 0000 9010 2000 b010 0008 81c7 e008 81e8 0000 033f ffff 8200 63a0 9de3 8001
0463100 f027 a044 f227 a048 d007 a048 7fff 8bf8 0100 0000 d207 a044 d022 6018 d407 a044 d602 a014 c202 e00c d807 a044 da03 2014
0463160 de53 6008 a010 000f d007 a044 9002 0010 9fc0 4000 0100 0000 9010 2000 b010 0008 81c7 e008 81e8 0000 033f ffff 8200 63a0
0463240 9de3 8001 f227 a048 d007 a048 7fff 8be0 0100 0000 d026 2008 9010 0018 d206 2008 7fff 8ecd 0100 0000 9010 2000 b010 0008
0463320 81c7 e008 81e8 0000 033f ffff 8200 63a0 9de3 8001 f227 a048 1100 0000 9012 2000 d207 a048 4000 4e82 0100 0000 d206 2008
0463400 4000 4e7f 0100 0000 1300 0107 9212 6373 4000 4e7b 0100 0000 9006 200c 1300 0107 9212 6375 7fff 699e 0100 0000 9010 2000
0463460 b010 0008 81c7 e008 81e8 0000 033f ffff 8200 63a0 9de3 8001 f227 a048 9006 202c d207 a048 9410 2001 7fff 69e9 0100 0000
0463540 9010 2000 b010 0008 81c7 e008 81e8 0000 033f ffff 8200 63a0 9de3 8001 f227 a048 1100 0000 9012 2000 d207 a048 4000 4e5c
0463620 0100 0000 1300 0107 9212 6377 4000 4e58 0100 0000 d006 2008 d202 0000 c202 600c d406 2008 d602 8000 d852 e008 9a10 000c
0463700 d006 2008 9002 000d 1300 0107 9212 6379 9fc0 4000 0100 0000 9010 2000 b010 0008 81c7 e008 81e8 0000 033f ffff 8200 63c0
0463760 9de3 8001 f027 a044 f227 a048 9010 3fff 1080 0003 0100 0000 9010 2000 b010 0008 81c7 e008 81e8 0000 033f ffff 8200 63c0
*
0464120 9de3 8001 f027 a044 f227 a048 f427 a04c f627 a050 9010 2000 b010 0008 81c7 e008 81e8 0000 033f ffff 8200 63c0 9de3 8001
0464200 f027 a044 f227 a048 f427 a04c 9010 2000 b010 0008 81c7 e008 81e8 0000 033f ffff 8200 63c0 9de3 8001 f027 a044 f227 a048
0464260 f427 a04c 9010 2000 b010 0008 81c7 e008 81e8 0000 033f ffff 8200 63c0 9de3 8001 f027 a044 f227 a048 f427 a04c 9010 2000
0464340 1080 0003 0100 0000 9010 2000 b010 0008 81c7 e008 81e8 0000 033f ffff 8200 63c0 9de3 8001 f027 a044 f227 a048 9010 2000
0464420 1080 0003 0100 0000 9010 2000 b010 0008 81c7 e008 81e8 0000 033f ffff 8200 63c0 9de3 8001 f027 a044 f227 a048 9010 3fff
0464500 1080 0003 0100 0000 9010 2000 b010 0008 81c7 e008 81e8 0000 033f ffff 8200 63a0 9de3 8001 f22f a04b d006 2004 d202 2014
0464560 8090 0009 0280 000a 0100 0000 9010 0018 4000 4dc1 0100 0000 8090 0008 1280 0004 0100 0000 1080 0043 0100 0000 d006 2004
0464640 d202 2008 d402 6010 d606 2004 d802 e008 da03 200c 80a3 400a 0a80 0014 0100 0000 de06 2004 e003 e008 e204 2024 c204 6014
0464720 e406 2004 e604 a008 e804 e024 ea55 2010 ac10 0015 ee06 2004 d005 e008 9002 0016 d24f a04b 920a 60ff 9fc0 4000 0100 0000
0465000 1080 000d 0100 0000 f206 2004 f406 6008 f606 a00c b606 e001 f626 a00c b826 e001 d04f a04b 912a 2018 913a 2018 d02f 0000
0465060 900a 20ff 80a2 3fff 1290 000e 0100 0000 d006 2004 d202 200c 9212 6003 d222 200c d406 2004 d602 a010 9612 e003 d622 a010
0465140 d806 2004 da03 2010 9a13 6003 da23 2010 de06 2004 e003 e01c 8090 0010 0280 0008 0100 0000 9010 0018 4000 4d82 0100 0000
0465220 a210 2000 1080 0003 0100 0000 a210 2000 9010 0018 1080 0003 0100 0000 9010 2000 b010 0008 81c7 e008 81e8 0000 033f ffff
0465300 8200 63a0 9de3 8001 8090 0018 1280 0009 0100 0000 9010 203c 4000 4d71 0100 0000 b010 0008 8090 0008 0280 0042 0100 0000
0465360 9010 0018 9210 2000 7fff 8d7b 0100 0000 b010 0008 1100 0107 d002 23d4 d026 0000 9206 2024 8090 0009 1280 0008 0100 0000
```

```
0465440 9010 200c 4000 4d5e 0100 0000 8090 0008 0280 000a 0100 0000 1500 0108 d402 a044 d426 202c c026 2028 c026 2024 9610 2000
0465520 1080 0003 0100 0000 9610 2000 9806 2024 1b00 0108 da03 6040 da26 202c 9e06 2024 a006 2030 8090 0010 1280 0008 0100 0000
0465600 9010 200c 4000 4446 0100 0000 8090 0008 0280 000a 0100 0000 2300 0108 e204 6044 e226 2038 c026 2034 c026 2030 a410 2000
0465660 1080 0003 0100 0000 a410 2000 a606 2030 2900 0108 e805 2040 e826 2038 aa06 2030 c026 2008 c026 200c c026 2010 c026 2018
0465740 c026 201c c026 2020 ac10 3fff ec26 2014 9010 0018 1030 0003 0100 0000 9010 2000 b010 0008 81c7 e008 81e8 0000 033f ffff
0466020 8200 6398 9de3 8001 9010 2002 d026 201c d006 2018 1300 0108 9212 6070 4000 4d3d 0100 0000 8090 0008 1280 0006 0100 0000
0466100 9210 2001 d226 2020 1080 0062 0100 0000 d006 2018 1300 0108 9212 6078 4000 4d31 0100 0000 8090 0008 1280 0006 0100 0000
0466160 9410 2002 d426 2020 1080 0056 0100 0000 d006 2018 1300 0108 9212 607f 4000 4d25 0100 0000 8090 0008 1280 0006 0100 0000
0466240 9610 2003 d626 2020 1080 004a 0100 0000 d006 2018 1300 0108 9212 6089 4000 4d19 0100 0000 8090 0008 1280 0006 0100 0000
0466320 9810 2004 d826 2020 1080 003e 0100 0000 d006 2018 1300 0108 9212 6095 4000 4d0d 0100 0000 8090 0008 1280 0006 0100 0000
0466400 9a10 2005 da26 2020 1080 0032 0100 0000 d006 2018 1300 0108 9212 609f 4000 4d01 0100 0000 8090 0008 1280 0006 0100 0000
0466460 9e10 2006 de26 2020 1080 0026 0100 0000 d006 2018 1300 0108 9212 60a5 4000 4cf5 0100 0000 8090 0008 1280 0006 0100 0000
0466540 a010 2007 e026 2020 1080 001a 0100 0000 d006 2018 1300 0108 9212 60ad 4000 4ce9 0100 0000 8090 0008 1280 0006 0100 0000
0466620 a210 2008 e226 2020 1080 000e 0100 0000 1100 0008 9012 2328 9210 2053 1500 0108 9412 a0b5 d606 2018 7fff 8b42 0100 0000
0466700 9010 2001 d027 bffc d207 bffc d226 2004 9010 2000 b010 0008 81c7 e008 81e8 0000 033f ffff 8200 6370 9de3 8001 f227 a048
0466760 d007 a048 d027 bffc d007 bffc 1300 0109 d202 62a8 7fff 73dd 0100 0000 7fff 8a08 0100 0000 d026 2024 d207 bffc 9402 6068
0467040 d427 bff4 d607 bff4 d802 e008 c203 201c da07 bff4 de03 6009 e053 e018 a210 0010 d007 bff4 9002 0011 1300 0108 9212 60cb
0467120 9fc0 4000 0100 0000 d027 bff8 e407 bff8 8090 0012 0280 000d 0100 0000 d007 bff8 9210 2002 7fff 6bd1 0100 0000 7fff 6bb4
0467200 0100 0000 8090 0008 0280 0004 0100 0000 a610 2001 e626 202c e807 bffc aa05 2068 ea27 bff0 ec07 bff0 ee05 a008 c205 e01c
0467260 f207 bff0 f406 6008 f656 a018 b810 001b d007 bff0 9002 001c 1300 0108 9212 60cf 9fc0 4000 0100 0000 d027 bff8 fa07 bff8
0467340 8090 001d 0280 000d 0100 0000 d007 bff8 9210 2002 7fff 6bb1 0100 0000 7fff 6b94 0100 0000 8090 0008 0280 0004 0100 0000
0467420 9010 2001 d026 2030 d207 bffc 9402 6068 d427 bfec d607 bfec d802 e008 c203 201c da07 bfec de03 6008 e053 e018 a210 0010
0467500 d007 bfec 9002 0011 1300 0108 9212 60d2 9fc0 4000 0100 0000 d027 bff8 e407 bff8 8090 0012 0280 000d 0100 0000 d007 bff8
0467560 9210 2002 7fff 6b91 0100 0000 7fff 6b74 0100 0000 8090 0008 0280 0004 0100 0000 a610 2001 e626 2034 e807 bffc aa05 2068
0467640 ea27 bfe8 ec07 bfe8 ee05 a008 c205 e01c f207 bfe8 f406 6008 f656 a018 b810 001b d007 bfe8 9002 001c 1300 0108 9212 60d5
0467720 9fc0 4000 0100 0000 d027 bff8 fa07 bff8 8090 001d 0280 000d 0100 0000 d007 bff8 9210 2002 7fff 6b71 0100 0000 7fff 6b54
0470000 0100 0000 8090 0008 0280 0004 0100 0000 9010 2001 d026 2038 d207 bffc 9402 6068 d427 bfe4 d607 bfe4 d802 e008 c203 201c
0470060 da07 bfe4 de03 6008 e053 e018 a210 0010 d007 bfe4 9002 0011 1300 0108 9212 60d8 9fc0 4000 0100 0000 d027 bff8 e407 bff8
0470140 8090 0012 0280 000d 0100 0000 d007 bff8 9210 2002 7fff 6b51 0100 0000 7fff 6b34 0100 0000 8090 0008 0280 0004 0100 0000
0470220 a610 2001 e626 203c e807 bffc aa05 2068 ea27 bfe0 ec07 bfe0 ee05 a008 c205 e01c f207 bfe0 f406 6008 f656 a018 b810 001b
0470300 d007 bfe0 9002 001c 1300 0109 9212 60db 9fc0 4000 0100 0000 d027 bff8 fa07 bff8 8090 001d 0280 000d 0100 0000 d007 bff8
0470360 9210 2002 7fff 6b31 0100 0000 7fff 6b14 0100 0000 8090 0008 0280 0004 0100 0000 9010 2001 d026 2040 d207 bffc 9402 6068
0470440 d427 bfdc d607 bfdc d802 e008 c203 201c da07 bfdc de03 6008 e053 e018 a210 0010 d007 bfdc 9002 0011 1300 0108 9212 60df
0470520 9fc0 4000 0100 0000 d027 bff8 e407 bff8 8090 0012 0280 000d 0100 0000 d007 bff8 9210 2002 7fff 6b11 0100 0000 7fff 6af4
0470600 0100 0000 8090 0008 0280 0004 0100 0000 a610 2001 e626 2044 e807 bffc aa05 2080 ea27 bfd8 ec07 bfd8 ee05 a008 c205 e01c
0470660 f207 bfd8 f406 6008 f656 a018 b810 001b d007 bfd8 9002 001c 1300 0108 9212 60e2 9fc0 4000 0100 0000 8090 0008 0280 0004
0470740 0100 0000 ba10 2001 fa26 2048 4007 bffc 7fff 7369 0100 0000 d026 2028 d006 2028 80a2 2002 0680 0006 0100 0000 d206 2028
0471020 80a2 6040 0480 000a 0100 0000 1100 0008 9012 232a 9210 2053 1500 0108 9412 a0f6 d606 2028 7fff 8a23 0100 0000 1080 009c
0471100 0100 0000 d006 202c 8090 0008 1280 0015 0100 0000 d206 2030 8090 0009 1280 0011 0100 0000 d406 2034 8090 000a 1280 000d
0471160 0100 0000 1100 0008 9012 232b 9210 2053 1500 0108 9412 a10e 7fff 8a0e 0100 0000 9010 2001 d027 bfd4 d207 bfd4 d226 2004
0471240 1080 0095 0100 0000 d406 2030 8090 000a 0280 0006 0100 0000 d606 2034 8090 000b 1280 000e 0100 0000 d806 2034 8090 000c
0471320 0280 0015 0100 0000 da06 2030 8090 000d 0280 0011 0100 0000 de06 2038 8090 000f 0280 000d 0100 0000 1100 0008 9012 232b
0471400 9210 2053 1500 0108 9412 a11a 7fff 89ed 0100 0000 9010 2001 d027 bfd4 d207 bfd4 d226 2004 1080 0074 0100 0000 d406 2030
0471460 8090 000a 1280 0021 0100 0000 d606 2034 8090 000b 1280 001d 0100 0000 d806 203c 8090 000c 1280 0019 0100 0000 da06 202c
0471540 8090 000d 1280 0015 0100 0000 de06 2040 8090 000f 1280 0011 0100 0000 e006 2038 8090 0010 1280 000d 0100 0000 1100 0008
0471620 9012 232b 9210 2053 1500 0108 9412 a126 7fff 89c8 0100 0000 9010 2001 d027 bfd4 d207 bfd4 d226 2004 1080 004f 0100 0000
0471700 d406 2030 8090 000a 1280 0015 0100 0000 d606 2034 8090 000b 1280 0011 0100 0000 d806 202c 8090 000c 1280 000d 0100 0000
0471760 1100 0008 9012 232b 9210 2053 1500 0108 9412 a132 7fff 89af 0100 0000 9010 2001 d027 bfd4 d207 bfd4 d226 2004 d406 2028
0472040 80a2 a004 0680 0006 0100 0000 d606 2028 80a2 e020 0480 000e 0100 0000 1100 0008 9012 232a 9210 2053 1500 0108 9412 a13e
0472120 d606 2028 7fff 899b 0100 0000 9010 2001 d027 bfd4 d207 bfd4 d226 2004 1080 0022 0100 0000 1100 0008 9012 232c 9210 2053
0472200 1500 0108 9412 a156 d606 2020 7fff 898d 0100 0000 9410 2001 d427 bfd4 d607 bfd4 d626 2004 1080 0014 0100 0000 d006 2020
0472260 9022 2001 90a2 2007 18bf ffef 912a 2002 1300 00a5 9212 60d4 d002 0009 81c2 0000 0100 0000 0002 9244 0002 92a8 0002 932c
0472340 0002 932c 0002 932c 0002 932c 0002 93c0 0002 93c0 9010 2000 b010 0008 81c7 e008 81e8 0000 033f ffff 8200 6378 9de3 8001
0472420 f227 a048 d007 a048 c02a 0000 1080 00fd 0100 0000 1100 00f5 d002 2358 4000 0915 0100 0000 ba10 0008 d006 202c 7fff 8a75
0472500 0100 0000 b810 0008 d006 2030 7fff 8a71 0100 0000 b610 0008 d006 2034 7fff 8a6d 0100 0000 b410 0008 d006 2038 7fff 8a69
```

F

```
0472560  0100 0000 d023 a06c d006 2028 d023 a05c f823 a060 f623 a064 f423 a068 d007 a048 1300 0108 9212 616d d406 201c d606 2020
0472640  da06 2024 9810 001d 4000 4ac3 0100 0000 1080 00ea 0100 0000 d206 2030 8090 0009 0280 000a 0100 0000 d406 2038 8090 000a
0472720  0280 0006 0100 0000 9610 2003 d627 bffc 1080 0025 0100 0000 d806 2030 8090 000c 0280 0006 0100 0000 9a10 2001 da27 bffc
0473000  1080 001d 0100 0000 de06 2034 8090 000f 0280 000a 0100 0000 e006 2038 8090 0010 0280 0006 0100 0000 a210 2004 e227 bffc
0473060  1080 0011 0100 0000 e406 2034 8090 0012 0280 0006 0100 0000 a610 2002 e627 bffc 1080 0009 0100 0000 1100 0008 9012 232e
0473140  9210 2053 1500 0108 9412 a18c 7fff 8915 0100 0000 1100 00f5 d002 2358 4000 08c1 0100 0000 9810 0008 e806 2028 e823 a05c
0473220  ea07 bffc ea23 a060 d007 a048 1300 0108 9212 6197 d406 201c d606 2020 da06 2024 4000 4a81 0100 0000 1080 00a8 0100 0000
0473300  1100 00f5 d002 2358 4000 08ae 0100 0000 ba10 0008 d006 2030 7fff 8a0e 0100 0000 b810 0008 d006 2034 7fff 8a0a 0100 0000
0473360  b610 0008 d006 203c 7fff 8a06 0100 0000 b410 0008 d006 202c 7fff 8a02 0100 0000 b210 0008 d006 2040 7fff 89fe 0100 0000
0473440  ae10 0008 d006 2044 7fff 89fa 0100 0000 ac10 0008 d006 2038 7fff 89f6 0100 0000 d023 a078 d006 2028 d023 a05c f823 a060
0473520  f623 a064 f423 a068 f223 a06c ee23 a070 ec23 a074 d007 a048 1300 0108 9212 61af d406 201c d606 2020 da06 2024 9810 001d
0473600  4000 4a4d 0100 0000 1080 0074 0100 0000 1100 00f5 d002 2358 4000 087a 0100 0000 ba10 0008 d006 2030 7fff 89da 0100 0000
0473660  b810 0008 d006 2034 7fff 89d6 0100 0000 b610 0008 d006 203c 7fff 89d2 0100 0000 b410 0008 d006 202c 7fff 89ce 0100 0000
0473740  b210 0008 d006 2040 7fff 89ca 0100 0000 ae10 0008 d006 2044 7fff 89c6 0100 0000 ac10 0008 d006 2038 7fff 89c2 0100 0000
0474020  d023 a078 d206 2028 d223 a05c d406 2048 d423 a07c f823 a060 f623 a064 f423 a068 f223 a06c ee23 a070 ec23 a074 d007 a048
0474100  1300 0108 9212 61d7 d406 201c d606 2020 da06 2024 9810 001d 4000 4a17 0100 0000 1080 003e 0100 0000 1100 00f5 d002 2358
0474160  4000 0844 0100 0000 ba10 0008 d006 2030 7fff 89a4 0100 0000 b810 0008 d006 2034 7fff 89a0 0100 0000 b610 0008 d006 202c
0474240  7fff 899c 0100 0000 d023 a068 d606 2028 d623 a05c f823 a060 f623 a064 d007 a048 1300 0108 9212 6202 d406 201c d606 2020
0474320  da06 2024 9810 001d 4000 49f7 0100 0000 1080 001e 0100 0000 1100 0008 9012 232c 9210 2053 1500 0108 9412 a21e d606 2020
0474400  7fff 8870 0100 0000 1080 0014 0100 0000 d006 2020 9022 2001 80a2 2007 18bf fff3 912a 2002 1300 00a6 9212 6138 d002 0009
0474460  81c2 0000 0100 0000 0002 9524 0002 95b8 0002 96c0 0002 96c0 0002 96c0 0002 9790 0002 9868 0002 9868 d007 a048 1080 0003
0474540  0100 0000 9010 2000 b010 0008 81c7 e008 81e8 0000 033f ffff 8200 63a0 9de3 8001 1100 012b 9012 22f0 4000 49d7 0100 0000
0474620  9010 2000 b010 0008 81c7 e008 81e8 0000 033f ffff 8200 63a0 9de3 8001 1100 012b 9012 22f0 9210 2002 4000 49ce 0100 0000
0474700  9010 2000 b010 0008 81c7 e008 81e8 0000 033f ffff 8200 63a0 9de3 8001 f027 a044 f227 a048 d007 a048 7fff 8711 0100 0000
0474760  d207 a044 d022 6018 d407 a044 d602 a014 c202 e00c d807 a044 da03 2014 de53 6008 a010 000f d007 a044 9002 0010 9fc0 4000
0475040  0100 0000 9010 2000 b010 0008 81c7 e008 81e8 0000 033f ffff 8200 63a0 9de3 8001 f227 a048 d007 a048 7fff 86f9 0100 0000
0475120  d026 2008 9010 0018 d206 2008 7fff 89e6 0100 0000 9010 2000 b010 0008 81c7 e008 81e8 0000 033f ffff 8200 63a0 9de3 8001
0475200  f227 a048 1100 0000 9012 2000 d207 a048 4000 499b 0100 0000 d206 2008 4000 4998 0100 0000 1300 0108 9212 6235 4000 4994
0475260  0100 0000 9006 200c 1300 0108 9212 6237 7fff 64b7 0100 0000 9010 2000 b010 0008 81c7 e008 81e8 0000 033f ffff 8200 63a0
0475340  9de3 8001 f227 a048 9006 202c d207 a048 9410 2001 7fff 6502 0100 0000 9010 2000 b010 0008 81c7 e008 81e8 0000 033f ffff
0475420  8200 63a0 9de3 8001 f227 a048 1100 0000 9012 2000 d207 a048 4000 4975 0100 0000 1300 0108 9212 6239 4000 4971 0100 0000
0475500  d006 2008 d202 0000 c202 600c d406 2008 d602 8000 d852 e008 9a10 000c d006 2008 9002 000d 1300 0108 9212 623b 9fc0 4000
0475560  0100 0000 9010 2000 b010 0008 81c7 e008 81e8 0000 033f ffff 8200 63c0 9de3 8001 f027 a044 f227 a048 9010 3fff 1080 0003
*
0475720  0100 0000 9010 2000 b010 0008 81c7 e008 81e8 0000 033f ffff 8200 63c0 9de3 8001 f027 a044 f227 a048 f427 a04c f627 a050
0476000  9010 2000 b010 0008 81c7 e008 81e8 0000 033f ffff 8200 63c0 9de3 8001 f027 a044 f227 a048 f427 a04c 9010 2000 b010 0008
0476060  81c7 e008 81e8 0000 033f ffff 8200 63c0 9de3 8001 f027 a044 f227 a048 f427 a04c 9010 2000 b010 0008 81c7 e008 81e8 0000
0476140  033f ffff 8200 63c0 9de3 8001 f027 a044 f227 a048 f427 a04c 9010 2000 1080 0003 0100 0000 9010 2000 b010 0008 81c7 e008
0476220  81e8 0000 033f ffff 8200 63c0 9de3 8001 f027 a044 f227 a048 9010 2000 1080 0003 0100 0000 9010 2000 b010 0008 81c7 e008
0476300  81e8 0000 033f ffff 8200 63c0 9de3 8001 f027 a044 f227 a048 9010 3fff 1080 0003 0100 0000 9010 2000 b010 0008 81c7 e008
0476360  81e8 0000 0000 0000 033f ffff 8200 63a0 9de3 8001 f22f a04b d006 2004 d202 2014 8090 0009 0280 000a 0100 0000 9010 0018
0476440  4000 48d9 0100 0000 8090 0008 1280 0004 0100 0000 1080 0043 0100 0000 d006 2004 d202 2008 d402 6010 d606 2004 d802 e008
0476520  da03 200c 80a3 400a 0a80 0014 0100 0000 de06 2004 e003 e008 e204 2024 c204 6014 e406 2004 e604 a008 e804 e024 ea55 2010
0476600  ac10 0015 ee06 2004 d005 e008 9002 0016 d24f a04b 920a 60ff 9fc0 4000 0100 0000 1080 000d 0100 0000 f206 2004 f406 6008
0476660  f606 a00c b606 e001 f626 a00c b826 e001 d04f a04b 912a 2018 913a 2018 d02f 0000 900a 20ff 80a2 3fff 1280 000e 0100 0000
0476740  d006 2004 d202 200c 9212 6003 d222 200c d406 2004 d602 a010 9612 e003 d622 a010 d806 2004 da03 2010 9a13 6003 da23 2010
0477020  de06 2004 e003 e01c 8090 0010 0280 0008 0100 0000 9010 0018 4000 489a 0100 0000 a210 2000 1080 0003 0100 0000 a210 2000
0477100  9010 0018 1080 0003 0100 0000 9010 2000 b010 0008 81c7 e008 81e8 0000 033f ffff 8200 63a0 9de3 8001 8090 0018 1280 0009
0477160  0100 0000 9010 203c 4000 4889 0100 0000 b010 0008 8090 0008 0280 0042 0100 0000 9010 0018 9210 2000 7fff 8893 0100 0000
0477240  b010 0008 1100 0108 d002 2294 d026 0000 9206 2024 8090 0009 1280 0008 0100 0000 9010 200c 4000 4876 0100 0000 8090 0008
0477320  0280 000a 0100 0000 1500 0108 d402 a304 d426 202c c026 2028 c026 2024 9610 2000 1080 0003 0100 0000 9610 2000 9806 2024
0477400  1b00 0108 da03 6300 da26 202c 9e06 2024 a006 2030 8090 0010 1280 0008 0100 0000 9010 200c 4000 485e 0100 0000 8090 0008
0477460  0280 000a 0100 0000 2300 0108 e204 6304 e226 2038 c026 2034 c026 2030 a410 2000 1080 0003 0100 0000 a410 2000 a606 2030
0477540  2900 0108 e805 2300 e826 2038 aa06 2030 c026 2008 c026 200c c026 2010 c026 2018 c026 201c c026 2020 ac10 3fff ec26 2014
0477620  9010 0018 1080 0003 0100 0000 9010 2000 b010 0008 81c7 e008 81e8 0000 033f ffff 8200 63c0 9de3 8001 f027 a044 d007 a044
```

```
0477700 9210 2005 d222 201c d407 a044 c022 a020 9010 2000 b010 0008 81c7 e008 81e8 0000 033f ffff 8200 6388 9de3 8001 f227 a048
0477760 d007 a048 d027 bffc d007 bffc 1300 0109 d202 62a8 7fff 6f5d 0100 0000 7fff 8588 0100 0000 d026 2024 d207 bffc 9402 6080
0500040 d427 bff8 d607 bff8 d802 e008 c203 201c da07 bff8 de03 6008 e053 e018 a210 0010 d007 bff8 9002 0011 1300 0108 9212 6330
0500120 9fc0 4000 0100 0000 8090 0008 0280 0004 0100 0000 a410 2001 e426 2030 e607 bffc a804 e080 e827 bff4 ea07 bff4 ec05 6008
0500200 c205 a01c ee07 bff4 f205 e008 f456 6018 b610 001a d007 bff4 9002 001b 1300 0108 9212 6340 9fc0 4000 0100 0000 8090 0008
0500260 0280 0004 0100 0000 b810 2001 f826 2034 fa07 bffc 9007 6068 d027 bff0 d207 bff0 d402 6008 c202 a01c d607 bff0 d802 e008
0500340 da53 2018 9e10 000d d007 bff0 9002 000f 1300 0108 9212 634f 9fc0 4000 0100 0000 8090 0008 0280 0004 0100 0000 a010 2001
0500420 e026 202c d007 bffc 7fff 6f9f 0100 0000 d026 2028 e206 2028 80a4 6002 0680 0006 0100 0000 e406 2028 80a4 a007 0480 000e
0500500 0100 0000 1100 0008 9012 232a 9210 2053 1500 0108 9412 a352 d606 2028 7fff 8659 0100 0000 9010 2001 d027 bfec d207 bfec
0500560 d226 2004 d406 2028 d426 2020 9010 2000 b010 0008 81c7 e008 81e8 0000 033f ffff 8200 6398 9de3 8001 f227 a048 d007 a048
0500640 c02a 0000 1100 00f5 d002 2358 4000 05f5 0100 0000 ba10 0008 d006 202c 7fff 8755 0100 0000 b810 0008 d006 2030 7fff 8751
0500720 0100 0000 b610 0008 d006 2034 7fff 874d 0100 0000 d023 a064 f923 a05c f623 a060 d007 a048 1300 0108 9212 636a d406 201c
0501000 d606 2020 da06 2024 9810 001d 4000 47aa 0100 0000 d007 a048 1080 0003 0100 0000 9010 2000 b010 0008 81c7 e008 81e8 0000
0501060 033f ffff 8200 63a0 9de3 8001 1100 012b 9012 22f8 4000 47a8 0100 0000 9010 2000 b010 0008 81c7 e008 81e8 0000 033f ffff
0501140 8200 63a0 9de3 8001 1100 012b 9012 22f8 9210 2002 40c0 479f 0100 0000 9010 2000 b010 0008 81c7 e008 81e8 0000 033f ffff
0501220 8200 63a0 9de3 8001 f027 a044 f227 a048 d007 a048 7fff 84e2 0100 0000 d207 a044 d022 6018 d407 a044 d602 a014 c202 e00c
0501300 d807 a044 da03 2014 de53 6008 a010 000f d007 a044 9002 0010 9fc0 4000 0100 0000 9010 2000 b010 0008 81c7 e008 81e8 0000
0501360 033f ffff 8200 63a0 9de3 8001 f227 a048 d007 a048 7fff 84ca 0100 0000 d026 2008 9010 0018 d206 2008 7fff 87b7 0100 0000
0501440 9010 2000 b010 0008 81c7 e008 81e8 000c 033f ffff 8200 63a0 9de3 8001 f227 a048 1100 0000 9012 2000 d207 a048 4000 476c
0501520 0100 0000 d206 2008 4000 4769 0100 0000 1300 0108 9212 6383 4000 4765 0100 0000 9006 200c 1300 0108 9212 6385 7fff 6280
0501600 0100 0000 9010 2000 b010 0008 81c7 e008 91e8 0000 033f ffff 8200 63a0 9de3 8001 f227 a048 9006 202c d207 a048 9410 2001
0501660 7fff 62d3 0100 0000 9010 2000 b010 0008 81c7 e008 81e8 0000 033f ffff 8200 63a0 9de3 8001 f227 a048 1100 0000 9012 2000
0501740 d207 a048 4000 4746 0100 0000 1300 0108 9212 6387 4000 4742 0100 0000 d006 2008 d202 0000 c202 600c d406 2008 d602 8000
0502020 d852 e008 9a10 000c d006 2008 9002 000d 1300 0108 9212 6389 9fc0 4000 0100 0000 9010 2000 b010 0008 81c7 e008 81e8 0000
0502100 033f ffff 8200 63c0 9de3 8001 f027 a044 f227 a048 9010 3fff 1080 0003 0100 0000 9010 2000 b010 0008 81c7 e008 81e8 0000
*
0502240 033f ffff 8200 63c0 9de3 8001 f027 a044 f227 a048 f427 a04c f627 a050 9010 2000 b010 0008 81c7 e008 81e8 0000 033f ffff
0502320 8200 63c0 9de3 8001 f027 a044 f227 a048 f427 a04c 9010 2000 b010 0008 81c7 e008 81e8 0000 033f ffff 8200 63c0 9de3 8001
0502400 f027 a044 f227 a048 f427 a04c 9010 2000 b010 0008 81c7 e008 81e8 0000 033f ffff 8200 63c0 9de3 8001 f027 a044 f227 a048
0502460 f427 a04c 9010 2000 1080 0003 0100 0000 9010 2000 b010 0008 81c7 e008 81e8 0000 033f ffff 8200 63c0 9de3 8001 f027 a044
0502540 f227 a048 9010 2000 1080 0003 0100 0000 9010 2000 b010 0008 81c7 e008 81e8 0000 033f ffff 8200 63c0 9de3 8001 f027 a044
0502620 f227 a048 9010 3fff 1080 0003 0100 0000 9010 2000 b010 0008 81c7 e008 81e8 0000 033f ffff 8200 63a0 9de3 8001 f22f a04b
0502700 d006 2004 d202 2014 8090 0009 0280 000a 0100 0000 9010 0018 4000 46ab 0100 0000 8090 0008 1280 0004 0100 0000 1080 0043
0502760 0100 0000 d006 2004 d202 2008 d402 6010 d606 2004 d802 e008 da03 200c 80a3 400a 0a80 0014 0100 0000 de06 2004 e003 e008
0503040 e204 2024 c204 6014 e406 2004 e604 a008 e804 e024 ea55 2010 ac10 0015 ee06 2004 d005 e008 9002 0016 d24f a04b 920a 60ff
0503120 9fc0 4000 0100 0000 1080 000d 0100 0000 f206 2004 f406 6009 f606 a00c b606 e001 f626 a00c b826 e001 d04f a04b 912a 2018
0503200 913a 2018 d02f 0000 900a 20ff 80a2 3fff 1280 000e 0100 0000 d006 2004 d202 200c 9212 6003 d222 200c d406 2004 d602 a010
0503260 9612 e003 d622 a010 d806 2004 da03 2010 9a13 6003 da23 2010 de06 2004 e003 e01c 8090 0010 0280 0008 0100 0000 9010 0018
0503340 4000 466c 0100 0000 a210 2000 1080 0003 0100 0000 a210 2000 9010 0018 1080 0003 0100 0000 9010 2000 b010 0008 81c7 e008
0503420 81e8 0000 033f ffff 8200 63a0 9de3 8001 8090 0018 1280 0009 0100 0000 9010 203c 4000 465b 0100 0000 b010 0008 8090 0008
0503500 0280 0042 0100 0000 9010 0018 9210 2000 7fff 8665 0100 0000 b010 0008 1100 0108 d002 23e4 d026 0000 9206 2024 8090 0009
0503560 1280 0008 0100 0000 9010 200c 4000 4648 0100 0000 8090 0008 0280 000a 0100 0000 1500 0109 d402 a054 d426 202c c026 2028
0503640 c026 2024 9610 2000 1080 0003 0100 0000 9610 2000 9806 2024 1b00 0109 da03 6050 da26 202c 9e06 2024 a006 2030 8090 0010
0503720 1280 0008 0100 0000 9010 200c 4000 4630 0100 0000 8090 0008 0280 000a 0100 0000 2300 0109 e204 6054 e226 2038 c026 2034
0504000 c026 2030 a410 2000 1080 0003 0100 0000 a410 2000 a606 2030 2900 0109 e805 2050 e826 2038 aa06 2030 c026 2008 c026 200c
0504060 c026 2010 c026 2018 c026 201c c026 2020 ac10 3fff ec26 2014 9010 0018 1080 0003 0100 0000 9010 2000 b010 0008 81c7 e008
0504140 81e8 0000 033f ffff 8200 6398 9de3 8001 9010 2004 d026 201c d006 2018 1300 0109 9212 6080 4000 4627 0100 0000 8090 0008
0504220 1280 0006 0100 0000 9210 2001 d226 202c 1080 0026 0100 0000 d006 2018 1300 0109 9212 6084 400c 461b 0100 0000 809c 0008
0504300 1280 0006 0100 0000 9410 2002 d426 2020 1080 001a 0100 0000 d006 2018 1300 0109 9212 6088 4000 460f 0100 0000 8090 0008
0504360 1280 0006 0100 0000 9610 2003 d626 2020 1080 000e 0100 0000 1100 0008 9012 2328 9210 2053 1500 0109 9412 a08d d606 2018
0504440 7fff 8468 0100 0000 9010 2001 d027 bffc d207 bffc d226 2004 9010 2000 b010 0008 81c7 e008 81e8 0000 033f ffff 8200 6390
0504520 9de3 8001 f227 a048 d007 a048 d027 bffc d007 bffc 1300 0109 d202 62a8 7fff 6d03 0100 0000 7fff 832e 0100 0000 d026 2024
0504600 d207 bffc 9402 6080 d427 bff8 d607 bff8 d802 e008 c203 201c da07 bff8 de03 6008 e053 e018 a210 0010 d007 bff8 9002 0011
0504660 1300 0109 9212 60a7 9fc0 4000 0100 0000 8090 0008 0280 0004 0100 0000 a410 2001 e426 202c e606 202c 80a4 e001 1280 0005
0504740 0100 0000 e806 2020 a805 2003 e826 2020 d007 bffc 7fff 6d68 0100 0000 d026 2028 ea06 2028 80a5 6001 0680 0006 0100 0000
```

```
0505020  ec06 2028 80a5 a040 0480 000e 0100 0000 1100 0008 9012 232a 9210 2053 1500 0109 9412 a0b0 d606 2028 7fff 8422 0100 0000
0505100  9010 2001 d027 bff4 d207 bff4 d226 2004 9010 2000 b010 0008 81c7 e008 81e8 0000 033f ffff 8200 6398 9de3 8001 f227 a048
0505160  d007 a048 c02a 0000 1100 00f5 d002 2358 4000 03c0 0100 0000 9a10 0008 d206 2024 d223 a05c d406 2028 d423 a060 d007 a048
0505240  1300 0109 9212 60ce d406 201c d606 2020 1900 00f0 9813 22b8 4000 457f 0100 0000 d007 a048 1080 0003 0100 0000 9010 2000
0505320  b010 0008 81c7 e008 81e8 0000 033f ffff 8200 63a0 9de3 8001 1100 012b 9012 2300 4000 457d 0100 0000 9010 2000 b010 0008
0505400  81c7 e008 81e8 0000 033f ffff 8200 63a0 9de3 8001 1100 012b 9012 2300 9210 2002 4000 4574 0100 0000 9010 2000 b010 0008
0505460  81c7 e008 81e8 0000 033f ffff 8200 63a0 9de3 8001 f027 a044 f227 a048 d007 a048 7fff 82b7 0100 0000 d207 a044 d022 6018
0505540  d407 a044 d602 a014 c202 e00c d807 a044 da03 2014 de53 6008 a010 000f d007 a044 9002 0010 9fc0 4000 0100 0000 9010 2000
0505620  b010 0008 81c7 e008 81e8 0000 033f ffff 8200 63a0 9de3 8001 f227 a048 d007 a048 7fff 829f 0100 0000 d026 2008 9010 0018
0505700  d206 2008 7fff 858c 0100 0000 9010 2000 b010 0008 81c7 e008 81e8 0000 033f ffff 8200 63a0 9de3 8001 f227 a048 1100 0000
0505760  9012 2000 d207 a048 4000 4541 0100 0000 d206 2008 4000 453e 0100 0000 1300 0109 9212 60e4 4000 453a 0100 0000 9006 200c
0506040  1300 0109 9212 60e6 7fff 605d 0100 0000 9010 2000 b010 0008 81c7 e008 81e8 0000 033f ffff 8200 63a0 9de3 8001 f227 a048
0506120  9006 202c d207 a048 9410 2001 7fff 60a8 0100 0000 9010 2000 b010 0008 81c7 e008 81e8 0000 033f ffff 8200 63a0 9de3 8001
0506200  f227 a048 1100 0000 9012 2000 d207 a048 4000 451b 0100 0000 1300 0109 9212 60e8 4000 4517 0100 0000 d006 2008 d202 0000
0506260  c202 600c d406 2008 d602 8000 d852 e008 9a10 000c d006 2008 9002 000d 1300 0109 9212 60ea 9fc0 4000 0100 0000 9010 2000
0506340  b010 0008 81c7 e008 81e8 0000 033f ffff 8200 63c0 9de3 8001 f027 a044 f227 a048 9010 3fff 1080 0003 0100 0000 9010 2000
*
0506500  b010 0008 81c7 e008 81e8 0000 033f ffff 8200 63c0 9de3 8001 f027 a044 f227 a048 f427 a04c f627 a050 9010 2000 b010 0008
0506560  81c7 e008 81e8 0000 033f ffff 8200 63c0 9de3 8001 f027 a044 f227 a048 f427 a04c 9010 2000 b010 0008 81c7 e008 81e8 0000
0506640  033f ffff 8200 63c0 9de3 8001 f027 a044 f227 a048 f427 a04c 9010 2000 b010 0008 81c7 e008 81e8 0000 033f ffff 8200 63c0
0506720  9de3 8001 f027 a044 f227 a048 f427 a04c 9010 2000 1080 0003 0100 0000 9010 2000 b010 0008 81c7 e008 81e8 0000 033f ffff
0507000  8200 63c0 9de3 8001 f027 a044 f227 a048 9010 2000 1080 0003 0100 0000 9010 2000 b010 0008 81c7 e008 81e8 0000 033f ffff
0507060  8200 63c0 9de3 8001 f027 a044 f227 a048 9010 3fff 1080 0003 0100 0000 9010 2000 b010 0008 81c7 e008 81e8 0000 0000 0000
0507140  033f ffff 8200 63a0 9de3 8001 f22f a04b d006 2004 d202 2014 8090 0009 0280 000a 0100 0000 9010 0018 4000 447f 0100 0000
0507220  8090 0008 1280 0004 0100 0000 1080 0043 0100 0000 d006 2004 d202 2008 d402 6010 d606 2004 d802 e008 da03 200c 80a3 400a
0507300  0a80 0014 0100 0000 de06 2004 e003 e008 e204 2024 c204 6014 e406 2004 e604 a008 e804 e024 ea55 2010 ac10 0015 ee06 2004
0507360  d005 e008 9002 0016 d24f a04b 920a 60ff 9fc0 4000 0100 0000 1080 000d 0100 0000 f206 2004 f406 6008 f606 a00c b606 e001
0507440  f626 a00c b826 e001 d04f a04b 912a 2018 913a 2018 d02f 0000 900a 20ff 80a2 3fff 1280 000e 0100 0000 d006 2004 d202 200c
0507520  9212 6003 d222 200c d406 2004 d602 a010 9612 e003 d622 a010 d806 2004 da03 2010 9a13 6003 da23 2010 de06 2004 e003 e01c
0507600  8090 0010 0280 0008 0100 0000 9010 0018 4000 4440 0100 0000 a210 2000 1080 0003 0100 0000 a210 2000 9010 0018 1080 0003
0507660  0100 0000 9010 2000 b010 0008 81c7 e008 81e8 0000 033f ffff 8200 63a0 9de3 8001 8090 0018 1280 0009 0100 0000 9010 203c
0507740  4000 442f 0100 0000 b010 0008 8090 0008 0280 0042 0100 0000 9010 0018 9210 2000 7fff 8439 0100 0000 b010 0008 1100 0109
0510020  d002 2144 d026 0000 9206 2024 8090 0009 1280 0008 0100 0000 9010 200c 4000 441c 0100 0000 8090 0008 0280 000a 0100 0000
0510100  1500 0109 d402 a1b4 d426 202c c026 2028 c026 2024 9610 2000 1080 0003 0100 0000 9610 2000 9806 2024 1b00 0109 da03 61b0
0510160  da26 202c 9e06 2024 a006 2030 8090 0010 1280 0008 0100 0000 9010 200c 4000 4404 0100 0000 8090 0008 0280 000a 0100 0000
0510240  2300 0109 e204 61b4 e226 2038 c026 2034 c026 2030 a410 2000 1080 0003 0100 0000 a410 2000 a606 2030 2900 0109 e805 21b0
0510320  e826 2038 aa06 2030 c026 2008 c026 200c c026 2010 c026 2018 c026 201c c026 2020 ac10 3fff ec26 2014 9010 0018 1080 0003
0510400  0100 0000 9010 2000 b010 0008 81c7 e008 81e8 0000 033f ffff 8200 63c0 9de3 8001 f027 a044 d007 a044 9210 2007 d222 201c
0510460  d407 a044 9610 2001 d622 a020 9010 2000 b010 0008 81c7 e008 81e8 0000 033f ffff 8200 6380 9de3 8001 f227 a048 d007 a048
0510540  d027 bffc d007 bffc 1300 0109 d202 62a8 7fff 6b02 0100 0000 7fff 812d 0100 0000 d026 2024 d207 bffc 9402 6080 d427 bfec
0510620  d607 bfec d802 e008 c203 201c da07 bfec de03 6008 e053 e018 a210 0010 d007 bfec 9002 0011 1300 0109 9212 61e0 9fc0 4000
0510700  0100 0000 d027 bff8 d007 bff8 9002 200c 9210 2001 7fff 5f83 0100 0000 e407 bff8 e604 a018 e627 bff0 e807 bffc aa05 2068
0510760  ea27 bfe8 ec07 bfe8 ee05 a008 c205 e01c f207 bfe8 f406 6008 f656 a018 b810 001b d007 bfe8 9002 001c d207 bff0 9fc0 4000
0511040  0100 0000 d027 bff4 d007 bff4 9210 2003 7fff 62e2 0100 0000 d027 bff4 d007 bff4 9002 202c 9210 2002 7fff 5f66 0100 0000
0511120  fa07 bff4 d007 6038 d026 202c d007 bffc 7fff 6b4d 0100 0000 d026 2028 d206 2028 80a2 6001 0680 0006 0100 0000 d406 2028
0511200  80a2 a080 0480 000e 0100 0000 1100 0008 9012 232a 9210 2053 1500 0109 9412 a1f1 d606 2028 7fff 8207 0100 0000 9010 2001
0511260  d027 bfe4 d207 bfe4 d226 2004 d406 202c 80a2 a002 0680 0006 0100 0000 d606 202c 80a2 e100 0480 000e 0100 0000 1100 9008
0511340  9012 232a 9210 2053 1500 0109 9412 a205 d606 202c 7fff 81f3 0100 0000 9010 2001 d027 bfe4 d207 bfe4 d226 2004 9010 2000
0511420  b010 0008 81c7 e008 81e8 0000 033f ffff 8200 6398 9de3 8001 f227 a048 d007 a048 c02a 0000 1100 00f5 d002 2358 4000 0191
0511500  0100 0000 9810 0008 d206 202c d223 a05c d406 2028 d423 a060 d007 a048 1300 0109 9212 6219 d406 201c d606 2020 da06 2024
0511560  4000 4351 0100 0000 d007 a048 1080 0003 0100 0000 9010 2000 b010 0008 81c7 e008 81e8 0000 033f ffff 8200 63a0 9de3 8001
0511640  1100 012b 9012 2308 4000 434f 0100 0000 9010 2000 b010 0008 81c7 e008 81e8 0000 033f ffff 8200 63a0 9de3 8001 1100 012b
0511720  9012 2308 9210 2002 4000 4346 0100 0000 9010 2000 b010 0008 81c7 e008 81e8 0000 033f ffff 8200 63a0 9de3 8001 f027 a044
0512000  f227 a048 d007 a048 7fff 8089 0100 0000 d207 a044 d022 6019 d407 a044 d602 a014 c202 e00c d807 a044 da03 2014 de53 6008
0512060  a010 000f d007 a044 9002 0010 9fc0 4000 0100 0000 9010 2000 b010 0008 81c7 e008 81e8 0000 033f ffff 8200 63a0 9de3 8001
```

```
0512140  f227 a048 d007 a048 7fff 8071 0100 0000 d026 2008 9010 0018 d206 2008 7fff 835e 0100 0000 9010 2000 b010 0008 81c7 e008
0512220  81e8 0000 033f ffff 8200 63a0 9de3 8001 f227 a048 1100 0000 9012 2000 d207 a048 4000 4313 0100 0000 d206 2008 4000 4310
0512300  0100 0000 1300 0109 9212 622f 4000 430c 0100 0000 9006 200c 1300 0109 9212 6231 7fff 5e2f 0100 0000 9010 2000 b010 0008
0512360  81c7 e008 81e8 0000 033f ffff 8200 63a0 9de3 8001 f227 a048 9006 202c d207 a048 9410 2001 7fff 5e7a 0100 0000 9010 2000
0512440  b010 0008 81c7 e008 81e8 0000 033f ffff 8200 63a0 9de3 8001 f227 a048 1100 0000 9012 2000 d207 a048 4000 42ed 0100 0000
0512520  1300 0109 9212 6233 4000 42e9 0100 0000 d006 2008 d202 0000 c202 600c d406 2008 d602 8000 d852 e008 9a10 000c d006 2008
0512600  9002 000d 1300 0109 9212 6235 9fc0 4000 0100 0000 9010 2000 b010 0008 81c7 e008 81e8 0000 033f ffff 8200 63c0 9de3 8001
0512660  f027 a044 f227 a048 9010 3fff 1080 0003 0100 0000 9010 2000 b010 0008 81c7 e008 81e8 0000 033f ffff 8200 63c0 9de3 8001
*
0513020  f027 a044 f227 a048 f427 a04c f627 a050 9010 2000 b010 0008 81c7 e008 81e8 0000 033f ffff 8200 63c0 9de3 8001 f027 a044
0513100  f227 a048 f427 a04c 9010 2000 b010 0008 81c7 e008 81e8 0000 033f ffff 8200 63c0 9de3 8001 f027 a044 f227 a048 f427 a04c
0513160  9010 2000 b010 0008 81c7 e008 81e8 0000 033f ffff 8200 63c0 9de3 8001 f027 a044 f227 a048 f427 a04c 9010 2000 1080 0003
0513240  0100 0000 9010 2000 b010 0008 81c7 e008 81e8 0000 033f ffff 8200 63c0 9de3 8001 f027 a044 f227 a048 9010 2000 1080 0003
0513320  0100 0000 9010 2000 b010 0008 81c7 e008 81e8 0000 033f ffff 8200 63c0 9de3 8001 f027 a044 f227 a048 9010 3fff 1080 0003
0513400  0100 0000 9010 2000 b010 0008 81c7 e008 81e8 0000 0000 0000 033f ffff 8200 63a0 9de3 8001 f22f a04b d006 2004 d202 2014
0513460  8090 0009 0280 000a 0100 0000 9010 0018 4000 4251 0100 0000 8090 0008 1280 0004 0100 0000 1080 0043 0100 0000 d006 2004
0513540  d202 2008 d402 6010 d606 2004 d802 e008 da03 200c 80a3 400a 0a80 0014 0100 0000 de06 2004 e003 e008 e204 2024 c204 6014
0513620  e406 2004 e604 a008 e804 e024 ea55 2010 ac10 0015 ee06 2004 d005 e008 9002 0016 d24f a04b 920a 60ff 9fc0 4000 0100 0000
0513700  1080 000d 0100 0000 f206 2004 f406 6008 f606 a00c b606 e001 f626 a00c b826 e001 d04f a04b 912a 2018 913a 2018 d02f 0000
0513760  900a 20ff 80a2 3fff 1280 000e 0100 0000 d006 2004 d202 200c 9212 6003 d222 200c d406 2004 d602 a010 9612 e003 d622 a010
0514040  d806 2004 da03 2010 9a13 6003 da23 2010 de06 2004 e003 e01c 8090 0010 0280 0008 0100 0000 9010 0018 4000 4212 0100 0000
0514120  a210 2000 1080 0003 0100 0000 a210 2000 9010 0018 1080 0003 0100 0000 9010 2000 b010 0008 81c7 e008 81e8 0000 033f ffff
0514200  8200 63a0 9de3 8001 f227 a048 d007 a048 7fff 7f67 0100 0000 d026 0000 d006 0000 1300 0109 9212 6240 4000 421e 0100 0000
0514260  8090 0008 1280 0007 0100 0000 c026 2004 9010 2063 d026 2008 1080 002a 0100 0000 d006 0000 1300 0109 9212 6248 4000 4211
0514340  0100 0000 8090 0008 1280 0008 0100 0000 9010 2001 d026 2004 9210 2063 d226 2008 1080 001c 0100 0000 d006 0000 1300 0109
0514420  9212 624e 4000 4203 0100 0000 8090 0008 1280 0008 0100 0000 9010 3fff d026 2004 9210 2063 d226 2008 1080 000e 0100 0000
0514500  d006 0000 1300 0109 9212 6256 4000 41f5 0100 0000 8090 0008 1280 0006 0100 0000 9010 3fff d026 2004 9210 2063 d226 2008
0514560  9010 2000 b010 0008 81c7 e008 81e8 0000 033f ffff 8200 63a0 9de3 8001 d006 2004 80a2 3fff 0280 0005 0100 0000 d006 2004
0514640  1080 000e 0100 0000 1100 0008 9012 2328 9210 2053 1500 0109 9412 a25d d606 0000 7fff 8040 0100 0000 9010 2000 1080 0003
0514720  0100 0000 9010 2000 b010 0008 81c7 e008 81e8 0000 033f ffff 8200 63a0 9de3 8001 d006 2008 80a2 2063 0280 0005 0100 0000
0515000  d006 2008 1080 000e 0100 0000 1100 0008 9012 2328 9210 2053 1500 0109 9412 a27e d606 0000 7fff 8027 0100 0000 9010 2000
0515060  1080 0003 0100 0000 9010 2000 b010 0008 81c7 e008 81e8 0000 033f ffff 8200 63a0 9de3 8001 1100 012b 9012 2310 4000 41a2
0515140  0100 0000 9010 2000 b010 0008 81c7 e008 81e8 0000 033f ffff 8200 63a0 9de3 8001 1100 012b 9012 2310 9210 2002 4000 4199
0515220  0100 0000 9010 2000 b010 0008 81c7 e008 81e8 0000 0000 0000 033f ffff 8200 63a0 9de3 8001 f22f a04b d006 2004 d202 2014
0515300  8090 0009 0280 000a 0100 0000 9010 0018 4000 416d 0100 0000 8090 0008 1280 0004 0100 0000 1080 0043 0100 0000 d006 2004
0515360  d202 2008 d402 6010 d606 2004 d802 e008 da03 200c 80a3 400a 0a80 0014 0100 0000 de06 2004 e003 e008 e204 2024 c204 6014
0515440  e406 2004 e604 a008 e804 e024 ea55 2010 ac10 0015 ee06 2004 d005 e008 9002 0016 d24f a04b 920a 60ff 9fc0 4000 0100 0000
0515520  1080 000d 0100 0000 f206 2004 f406 6008 f606 a00c b606 e001 f626 a00c b826 e001 d04f a04b 912a 2018 913a 2018 d02f 0000
0515600  900a 20ff 80a2 3fff 1280 000e 0100 0000 d006 2004 d202 200c 9212 6003 d222 200c d406 2004 d602 a010 9612 e003 d622 a010
0515660  d806 2004 da03 2010 9a13 6003 da23 2010 de06 2004 e003 e01c 8090 0010 0280 0008 0100 0000 9010 0018 4000 412e 0100 0000
0515740  a210 2000 1080 0003 0100 0000 a210 2000 9010 0018 1080 0003 0100 0000 9010 2000 b010 0008 81c7 e008 81e8 0000 033f ffff
0516020  8200 63a0 9de3 8001 1100 0000 9012 2600 1300 0109 9212 6318 4000 4135 0100 0000 9010 2000 b010 0008 81c7 e008 81e8 0000
0516100  033f ffff 8200 63a0 9de3 8001 f227 a048 f427 a04c 8090 0018 1280 0009 0100 0000 9010 2010 4000 410e 0100 0000 b010 0008
0516160  8090 0008 0280 0014 0100 0000 9010 0018 9210 2000 7fff 8118 0100 0000 b010 0008 d007 a048 7fff 7e66 0100 0000 9210 0008
0516240  9010 0018 7fff 8154 0100 0000 d007 a04c 7fff 7e5f 0100 0000 d026 2008 9010 3fff d026 200c 9010 0018 1080 0003 0100 0000
0516320  9010 2000 b010 0008 81c7 e008 81e8 0000 033f ffff 8200 6388 9de3 8001 f227 a048 f427 a04c 9006 2008 d207 a048 7fff 84d6
0516400  0100 0000 d027 bffc d007 bffc 8090 0008 0280 000b 0100 0000 9010 23f2 9210 2053 1500 0109 9412 a322 d607 a048 7fff 7f65
0516460  0100 0000 1080 004d 0100 0000 c027 bff4 2010 2000 d207 a048 d407 a04c 7fff ffbd 0100 0000 d027 bff0 d007 bff4 8090 0008
0516540  1280 0009 0100 0000 9010 200c 4000 40cc 0100 0000 d027 bff4 8090 0008 0280 0034 0100 0000 d207 bff4 d227 bfec c027 bfe8
0516620  d407 bfec 8090 000a 1280 0009 0100 0000 9010 2008 4000 40be 0100 0000 d027 bfec 8090 0008 0280 001a 0100 0000 d607 bfec
0516700  8090 000b 1280 0008 0100 0000 9010 2004 4000 40b3 0100 0000 8090 0008 0280 0008 0100 0000 d807 bfec 1b00 0109 da03 6314
0516760  da23 0000 1080 0003 0100 0000 9a10 2000 de07 bfec de27 bfec e007 bfec e207 bfe8 e224 2004 1080 0003 0100 0000 a210 2000
0517040  e407 bfec e427 bff4 e607 bff4 2900 0109 e805 2310 e824 c000 ea07 bff4 ec07 bff0 ec25 6008 1080 0003 0100 0000 ac10 2000
0517120  ee07 bff4 ee27 bff8 9006 2008 d207 bff8 7fff 8293 0100 0000 9010 2000 b010 0008 81c7 e008 81e8 0000 033f ffff 8200 6390
0517200  9de3 8001 f227 a048 9006 2008 d207 a048 7fff 8471 0100 0000 d027 bff8 d007 bff8 8090 0008 1280 000c 0100 0000 9010 23f2
```

```
0517260  9210 2053 1500 0109 9412 a350 d607 a048 7fff 7f00 0100 0000 9010 2000 1080 0013 0100 0000 d007 bff8 d027 bffc d207 bffc
0517340  d402 600c d427 bff4 80a2 bfff 1280 0007 0100 0000 d007 bffc d206 0000 4000 000a 0100 0000 d027 bff4 d007 bff4 1080 0003
0517420  0100 0000 9010 2000 b010 0008 81c7 e008 81e8 0000 033f ffff 8200 63a0 9de3 8001 f227 a048 d006 2008 4000 4080 0100 0000
0517500  8090 0008 1280 0005 0100 0000 c026 200c 1080 0037 0100 0000 d006 2008 1300 0109 9212 636c 4000 406f 0100 0000 8090 0008
0517560  1280 0005 0100 0000 c026 200c 1080 002c 0100 0000 d006 2008 1300 0109 9212 636e 4000 4064 0100 0000 8090 0008 1280 0006
0517640  0100 0000 d007 a048 d026 200c 1080 0020 0100 0000 d006 2008 4000 4060 0100 0000 80a2 2001 1280 0012 0100 0000 d206 2008
0517720  d44a 4000 9610 000a 1900 011e 9813 2199 da4a c00c 9e10 000d 808b e004 0280 0008 0100 0000 d006 2008 4000 4053 0100 0000
0520000  d026 200c 1080 000a 0100 0000 9010 23ea 9210 2053 1500 0109 9412 a370 d606 2008 7fff 7ea8 0100 0000 c026 200c d006 200c
0520060  1080 0003 0100 0000 9010 2000 b010 0008 81c7 e008 81e8 0000 033f ffff 8200 63a0 9de3 8001 1100 012b 9012 2318 4000 4022
0520140  0100 0000 9010 2050 4000 400d 0100 0000 1300 0109 d022 62a8 9010 2000 b010 0008 81c7 e008 81e8 0000 033f ffff 8200 63a0
0520220  9de3 8001 1100 012b 9012 2318 9210 2002 4000 4014 0100 0000 9010 2000 b010 0008 81c7 e008 81e8 0000 033f ffff 8200 63c0
0520300  9de3 8001 f027 a044 f227 a048 9010 2000 1080 0003 0100 0000 9010 2000 b010 0008 81c7 e008 81e8 0000 033f ffff 8200 63c0
0520360  9de3 8001 f027 a044 f227 a048 9010 2000 b010 0008 81c7 e008 81e8 0000 033f ffff 8200 63c0 9de3 8001 f027 a044 f227 a048
0520440  9010 2000 b010 0008 81c7 e008 81e8 0000 033f ffff 8200 63c0 9de3 8001 f027 a044 9010 2000 b010 0008 81c7 e008 81e8 0000
0520520  033f ffff 8200 63a0 9de3 8001 f227 a048 1100 0000 9012 2000 d207 a048 4000 3fe4 0100 0000 1300 0109 9212 63a2 4000 3fe0
0520600  0100 0000 d006 2008 d202 0000 c202 600c d406 2008 d602 8000 d852 e008 9a10 000c d006 2008 9002 000d 1300 0109 9212 63a4
0520660  9fc0 4000 0100 0000 9010 2000 b010 0008 81c7 e008 81e8 0000 033f ffff 8200 63c0 9de3 8001 f027 a044 f227 a048 9010 3fff
0520740  1080 0003 0100 0000 9010 2000 b010 0008 81c7 e008 81e8 0000 033f ffff 8200 63a0 9de3 8001 f22f a04b d006 2004 d202 2014
0521020  9090 0009 0280 000a 0100 0000 9010 c018 4000 3f99 0100 0000 8090 0008 1280 0004 0100 0000 1080 0043 0100 0000 d006 2004
0521100  d202 2008 d402 6010 d606 2004 d802 e008 da03 200c 80a3 400a 0a80 0014 0100 0000 de06 2004 e003 e008 e204 2024 c204 6014
0521160  e406 2004 e604 a008 e804 e024 ea55 2010 ac10 0015 ee06 2004 d005 e008 9002 0016 d24f a04b 920a 60ff 9fc0 4000 0100 0000
0521240  1080 000d 0100 0000 f206 2004 f406 6008 f606 a00c b606 e001 f626 a00c b826 e001 d04f a04b 912a 2018 913a 2018 d02f 0000
0521320  900a 20ff 80a2 3fff 1280 000e 0100 0000 d006 2004 d202 200c 9212 6003 d222 200c d406 2004 d602 a010 9612 e003 d622 a010
0521400  d806 2004 da03 2010 9a13 6003 da23 2010 de06 2004 e003 e01c 8090 0010 0280 0008 0100 0000 9010 0018 4000 3f5a 0100 0000
0521460  a210 2000 1080 0003 0100 0000 a210 2000 9010 0018 1080 0003 0100 0000 9010 2000 b010 0008 81c7 e008 81e8 0000 033f ffff
0521540  8200 6398 9de3 8001 8090 0018 1280 0009 0100 0000 9010 202c 4000 3f49 0100 0000 b010 0008 8090 0008 0280 0030 0100 0000
0521620  8090 0018 1280 0008 0100 0000 9010 2018 4000 3f3f 0100 0000 8090 0008 0280 001f 0100 0000 1100 0109 d002 23c8 d026 2014
0521700  9206 2008 8090 0009 1280 0008 0100 0000 9010 200c 4000 3f32 0100 0000 8090 0008 0280 000a 0100 0000 1500 0109 d402 a3d0
0521760  d426 2010 c026 200c c026 2008 9610 2000 1080 0003 0100 0000 9610 2000 9806 2008 1b00 0109 da03 63cc da26 2010 9e06 2008
0522040  1080 0003 0100 0000 9e10 2000 2100 0109 e004 23c4 e026 2014 c026 2018 c027 bffc e207 bffc e226 2004 9010 0018 1080 0003
0522120  0100 0000 9010 2000 b010 0008 81c7 e008 81e8 0000 033f ffff 8200 6398 9de3 8001 8090 0018 1280 0009 0100 0000 9010 2040
0522200  4000 3f07 0100 0000 b010 0008 8090 0008 0280 0030 0100 0000 8090 0018 1280 0008 0100 0000 9010 2018 4000 3efd 0100 0000
0522260  8090 0008 0280 001f 0100 0000 1100 0109 d002 23c8 d026 2014 9206 2008 8090 0009 1280 0008 0100 0000 9010 200c 4000 3ef0
0522340  0100 0000 8090 0008 0280 000a 0100 0000 1500 0109 d402 a3d0 d426 2010 c026 200c c026 2008 9610 2000 1080 0003 0100 0000
0522420  9610 2000 9806 2008 1b00 0109 da03 63cc da26 2010 9e06 2008 1080 0003 0100 0000 9e10 2000 2100 0109 e004 23c0 e026 2014
0522500  c026 2018 c027 bffc e207 bffc e226 2004 9010 0018 1080 0003 0100 0000 9010 2000 b010 0008 81c7 e008 81e8 0000 033f ffff
0522560  8200 6398 9de3 8001 8090 0018 1280 0009 0100 0000 9010 2038 4000 3ec5 0100 0000 b010 0008 8090 0008 0280 0030 0100 0000
0522640  8090 0018 1280 0008 0100 0000 9010 2018 4000 3ebb 0100 0000 8090 0008 0280 001f 0100 0000 1100 0109 d002 23c8 d026 2014
0522720  9206 2008 8090 0009 1280 0008 0100 0000 9010 200c 4000 3eae 0100 0000 8090 0008 0280 000a 0100 0000 1500 0109 d402 a3d0
0523000  d426 2010 c026 200c c026 2008 9610 2000 1080 0003 0100 0000 9610 2000 9806 2008 1b00 0109 da03 63cc da26 2010 9e06 2008
0523060  1080 0003 0100 0000 9e10 2000 2100 0109 e004 23b8 e026 2014 c026 2018 c027 bffc e207 bffc e226 2004 9010 0018 1080 0003
0523140  0100 0000 9010 2000 b010 0008 81c7 e008 81e8 0000 033f ffff 8200 6398 9de3 8001 8090 0018 1280 0009 0100 0000 9010 2030
0523220  4000 3e83 0100 0000 b010 0008 8090 0008 0280 0030 0100 0000 8090 0018 1280 0008 0100 0000 9010 2018 4000 3e79 0100 0000
0523300  8090 0008 0280 001f 0100 0000 1100 0109 d002 23c8 d026 2014 9206 2008 8090 0009 1280 0008 0100 0000 9010 200c 4000 3e6c
0523360  0100 0000 8090 0008 0280 000a 0100 0000 1500 0109 d402 a3d0 d426 2010 c026 200c c026 2008 9610 2000 1080 0003 0100 0000
0523440  9610 2000 9806 2008 1b00 0109 da03 63cc da26 2010 9e06 2008 1080 0003 0100 0000 9e10 2000 2100 0109 e004 23b4 e026 2014
0523520  c026 2018 c027 bffc e207 bffc e226 2004 9010 0018 1080 0003 0100 0000 9010 2000 b010 0008 81c7 e008 81e8 0000 033f ffff
0523600  8200 6398 9de3 8001 8090 0018 1280 0009 0100 0000 9010 2030 4000 3e41 0100 0000 b010 0008 8090 0008 0280 0030 0100 0000
0523660  8090 0018 1280 0008 0100 0000 9010 2018 4000 3e37 0100 0000 8090 0008 0280 001f 0100 0000 1100 0109 d002 23c8 d026 2014
0523740  9206 2008 8090 0009 1280 0008 0100 0000 9010 200c 4000 3e2a 0100 0000 8090 0008 0280 000a 0100 0000 1500 0109 d402 a3d0
0524020  d426 2010 c026 200c c026 2008 9610 2000 1080 0003 0100 0000 9610 2000 9806 2008 1b00 0109 da03 63cc da26 2010 9e06 2008
0524100  1080 0003 0100 0000 9e10 2000 2100 0109 e004 23b0 e026 2014 c026 2018 c027 bffc e207 bffc e226 2004 9010 0018 1080 0003
0524160  0100 0000 9010 2000 b010 0008 81c7 e008 81e8 0000 033f ffff 8200 6398 9de3 8001 8090 0018 1280 0009 0100 0000 9010 204c
0524240  4000 3dff 0100 0000 b010 0008 8090 0008 0280 0030 0100 0000 8090 0018 1280 0008 0100 0000 9010 2018 4000 3df5 0100 0000
0524320  8090 0008 0280 001f 0100 0000 1100 0109 d002 23c8 d026 2014 9206 2008 8090 0009 1280 0008 0100 0000 9010 200c 4000 3de8
```

```
0524400  0100 0000 8090 0008 0280 000a 0100 0000 1500 0109 d402 a3d0 d426 2010 c026 200c c026 2008 9610 2000 1080 0003 0100 0000
0524460  9610 2000 9806 2008 1b00 0109 da03 63cc da26 2010 9e06 2008 1080 0003 0100 0000 9e10 2000 2100 0109 e004 23bc e026 2014
0524540  c026 2018 c027 bffc e207 bffc e226 2004 9010 0018 1080 0003 0100 0000 9010 2000 b010 0008 81c7 e008 81e8 0000 033f ffff
0524620  8200 6398 9de3 8001 f027 a044 f227 a048 c027 bff8 d007 a048 1300 010a 9212 6000 4000 3ddc 0100 0000 8090 0008 1280 004a
0524700  0100 0000 d007 a044 1300 010a 9212 6004 4000 3dd4 0100 0000 8090 0008 1280 0006 0100 0000 9010 2001 d027 bff8 1080 003c
0524760  0100 0000 d007 a044 1300 010a 9212 600a 4000 3dc8 0100 0000 8090 0008 1280 0006 0100 0000 9210 2002 d227 bff8 1080 0030
0525040  0100 0000 d007 a044 1300 010a 9212 6012 4000 3dbc 0100 0000 8090 0008 1280 0006 0100 0000 9410 2003 d427 bff8 1080 0024
0525120  0100 0000 d007 a044 1300 010a 9212 6016 4000 3db0 0100 0000 8090 0008 1280 0006 0100 0000 9610 2004 d627 bff8 1080 0018
0525200  0100 0000 d007 a044 1300 010a 9212 601e 4000 3da4 0100 0000 8090 0008 1280 0006 0100 0000 9810 2005 d827 bff8 1080 000c
0525260  0100 0000 d007 a044 1300 010a 9212 602b 4000 3d98 0100 0000 8090 0008 1280 0004 0100 0000 9a10 2006 da27 bff8 1080 000b
0525340  0100 0000 d007 a048 1300 010a 9212 6030 4000 3d8c 0100 0000 8090 0008 1280 0003 0100 0000 c027 bff8 d007 bff8 8090 0008
0525420  1280 000e 0100 0000 1100 0008 9012 2332 9210 2053 1500 010a 9412 a038 d607 a044 d807 a048 7fff 7be3 0100 0000 9010 2000
0525500  1080 0048 0100 0000 1080 0032 0100 0000 9010 2000 7fff fe02 0100 0000 d027 bffc 1080 003c 0100 0000 9010 2000 7fff fe3e
0525560  0100 0000 d027 bffc 1080 0036 0100 0000 9010 2000 7fff fe7a 0100 0000 d027 bffc 1080 0030 0100 0000 9010 2000 7fff feb6
0525640  0100 0000 d027 bffc 1080 002a 0100 0000 9010 2000 7fff fef2 0100 0000 d027 bffc 1080 0024 0100 0000 9010 2000 7fff ff2e
0525720  0100 0000 d027 bffc 1080 001e 0100 0000 1100 0008 9012 2332 9210 2053 1500 010a 9412 a05c d607 a044 d807 a048 7fff 7bb1
0526000  0100 0000 9010 2000 1080 0016 0100 0000 d007 bff8 80a2 2006 18bf fff2 912a 2002 1300 00b3 9212 6034 d002 0009 81c2 0000
0526060  0100 0000 0002 cbe0 0002 cb50 0002 cbc8 0002 cb68 0002 cb80 0002 cb98 0002 cbb0 d007 bffc 1080 0003 0100 0000 9010 2000
0526140  b010 0008 81c7 e008 81e8 0000 033f ffff 8200 63a0 9de3 8001 1100 012b 9012 2320 4000 3d19 0100 0000 9010 2000 b010 0008
0526220  81c7 e008 81e8 0000 033f ffff 8200 63a0 9de3 8001 1100 012b 9012 2320 9210 2002 4000 3d10 0100 0000 9010 2000 b010 0008
0526300  81c7 e008 81e8 0000 033f ffff 8200 63a0 9de3 8001 f227 a048 1100 0000 9012 2000 d207 a048 4000 3d06 0100 0000 1300 010a
0526360  9212 6080 4000 3d02 0100 0000 d006 2008 d202 0000 c202 600c d406 2008 d602 8000 d852 e008 9a10 000c d006 2008 9002 000d
0526440  1300 010a 9212 6082 9fc0 4000 0100 0000 9010 2000 b010 0008 81c7 e008 81e8 0000 033f ffff 8200 63c0 9de3 8001 f027 a044
0526520  f227 a048 9010 3fff 1080 0003 0100 0000 9010 2000 b010 0008 81c7 e008 81e8 0000 033f ffff 8200 63a0 9de3 8001 f027 a044
0526600  f227 a048 1100 011e 9012 22b4 d207 a044 d407 a048 4000 0008 0100 0000 1080 0003 0100 0000 9010 2000 b010 0008 81c7 e008
0526660  81e8 0000 033f ffff 8200 6358 9de3 8001 f027 a044 f227 a048 f427 a04c c027 bfbc c027 bfdc d007 a048 d207 bfdc d44a 0009
0526740  9610 000a 8090 000b 0280 0184 0100 0000 d007 a048 d207 bfdc d44a 0009 d42f bfe0 9610 2001 d627 bfd8 d807 a048 da07 bfdc
0527020  de4b 000d a010 000f 80a4 2025 0280 002f 0100 0000 d007 bfd8 80a2 201d 1680 0021 0100 0000 d207 a048 d407 bfdc 9602 400a
0527100  d807 bfd8 da4a c00c 9e10 000d 8090 000f 0280 0018 0100 0000 e007 a048 e207 bfdc a404 0011 e607 bfd8 e84c 8013 aa10 0014
0527160  80a5 6025 0280 000f 0100 0000 9027 a020 d207 bfd8 d407 a048 d607 bfdc 9802 800b da07 bfd8 de4b 000d de2a 0009 e007 bfd8
0527240  a204 2001 e227 bfd8 10bf ffdf 0100 0000 a427 a020 e607 bfd8 c02c 8013 9227 a020 d007 a044 4000 3c92 0100 0000 d027 bfd4
0527320  1080 0139 0100 0000 c027 bfd4 d007 bfd8 80a2 201d 1680 0030 0100 0000 d207 a048 d407 bfdc 9602 400a d807 bfd8 da4a c00c
0527400  9e10 000d 8090 000f 0280 0027 0100 0000 e007 a048 e207 bfdc a404 0011 e607 bfd8 d24c 8013 1100 010a 9012 20d8 4000 3ce6
0527460  0100 0000 8090 0008 1280 001b 0100 0000 d007 a048 d207 bfdc 9402 0009 d607 bfd8 d84a 800b 9a10 000c 80a3 602a 1280 0005
0527540  0100 0000 de07 bfd4 a003 e001 e027 bfd4 a227 a020 e407 bfd8 e607 a048 e807 bfdc aa04 c014 ec07 bfd8 ee4d 4016 ee2c 4012
0527620  f007 bfd8 b206 2001 f227 bfd8 10bf ffd0 0100 0000 f407 bfd8 80a6 a01d 1680 00fa 0100 0000 f607 a048 f807 bfdc ba06 c01c
0527700  d007 bfd8 d24f 4008 9410 0009 8090 000a 0280 00f1 0100 0000 9027 a020 d207 bfd8 d407 a048 d607 bfdc 9802 800b da07 bfd8
0527760  de4b 000d de2a 0009 e007 bfd8 a204 2001 e227 bfd8 a427 a020 e607 bfd8 c02c 8013 1080 0099 0100 0000 9227 a020 d007 a044
0530040  4000 3c2b 0100 0000 d027 bfd4 1080 00d8 0100 0000 1080 003b 0100 0000 d007 a04c 9002 2004 d027 a04c d202 3ffc d227 bfd0
0530120  9227 a020 d007 a044 d407 bfd0 4000 3c1c 0100 0000 d027 bfd4 1080 0036 0100 0000 d407 a04c 9402 a004 d427 a04c d602 bffc
0530200  d627 bfd0 d807 a04c 9803 2004 d827 a04c da03 3ffc da27 bfcc 9227 a020 d007 a044 d407 bfd0 d607 bfcc 4000 3c09 0100 0000
0530260  d027 bfd4 1080 0023 0100 0000 de07 a04c 9e03 e004 de27 a04c e003 fffc e027 bfd0 e207 a04c a204 6004 e227 a04c e404 7ffc
0530340  e427 bfcc e607 a04c a604 e004 e627 a04c e804 fffc e827 bfc8 9227 a020 d007 a044 d407 bfd0 d607 bfcc d807 bfc8 4000 3bf0
0530420  0100 0000 d027 bfd4 1080 000a 0100 0000 d007 bfd4 80a2 2000 02bf ffc5 80a2 2001 02bf ffd0 80a2 2002 02bf ffe1 0100 0000
0530500  1080 0093 0100 0000 1080 0041 0100 0000 d007 a04c 9002 2008 d027 a04c c102 3ff8 c302 3ffc c13f bfc0 9227 a020 d007 a044
0530560  d407 bfc0 d607 bfc4 4000 3bd5 0100 0000 d027 bfd4 1080 003a 0100 0000 d207 a04c 9202 6004 d227 a04c d402 7ffc d427 bfd0
0530640  d607 a04c 9602 e008 d627 a04c c502 fff8 c702 fffc c53f bfc0 9227 a020 d007 a044 d407 bfd0 d607 bfc0 d807 bfc4 4000 3bc0
0530720  0100 0000 d027 bfd4 1080 0025 0100 0000 d807 a04c 9803 2004 d827 a04c da03 3ffc da27 bfd0 de07 a04c 9e03 e004 de27 a04c
0531000  e003 fffc e027 bfcc e207 a04c a204 6008 e227 a04c c904 7ff8 cb04 7ffc c93f bfc0 9227 a020 d007 a044 d407 bfd0 d607 bfcc
0531060  d807 bfc0 da07 bfc4 4000 3ba5 0100 0000 d027 bfd4 1080 000a 0100 0000 d007 bfd4 80a2 2000 02bf ffbf 80a2 2001 02bf ffcc
0531140  80a2 2002 02bf ffdf 0100 0000 1080 0048 0100 0000 e407 bfdc e607 bfd8 a804 8013 aa25 2001 ec07 a048 d04d 8015 9022 2025
0531220  80a2 2053 1880 003e 1500 00b4 9412 a30c 9332 2004 ae10 0009 af2d e002 9202 4017 9202 4008 b010 200f 920a 4018 992a 6003
0531300  d603 000a 80a2 c008 0280 000d 0100 0000 80a2 ffff 0280 002e 0100 0000 9803 2008 980b 2078 d603 000a 80a2 c008 0280 0004
0531360  0100 0000 10bf fff7 0100 0000 9803 00ua 1003 2004 81c2 0000 0100 0000 0000 0000 0002 d018 0000 0053 0002 d034 0000 0033
0531440  0002 d034 0000 004e 0002 d034 0000 0040 0002 d148 0000 0041 0002 d148 0000 0042 0002 d148 ffff ffff 0002 d38c 0000 0044
```

```
0531520 0002 d034 0000 0050 0002 d034 0000 0020 0002 d148 ffff ffff 0002 d38c 0000 0022 0002 d148 0000 003e 0002 d034 0000 003f
0531600 0002 d034 0000 004a 0002 d034 1080 000a 0100 0000 1100 011e 9012 22c8 1300 010a 9212 60e7 4000 3b4a 0100 0000 4000 3bc9
0531660 0100 0000 d007 bfd4 8090 0008 1680 0005 0100 0000 d007 bfd4 1080 0010 0100 0000 d207 bfdc d407 bfd8 9602 400a d627 bfdc
0531740 d807 bfbc da07 bfd4 9e03 000d de27 bfbc 10bf fe79 0100 0000 d007 bfbc 1080 0003 0100 0000 9010 2000 b010 0008 81c7 e008
0532020 81e8 0000 033f ffff 8200 6360 9de3 8001 f027 a044 f227 a048 f427 a04c d007 a044 c02a 0000 c027 bfdc d207 a048 d407 bfdc
0532100 d64a 400a 9810 000b 8090 000c 0280 0191 0100 0000 d007 a048 d207 bfdc d44a 0009 d42f bfe0 9610 2001 d627 bfd8 d807 a048
0532160 da07 bfdc de4b 000d a010 000f 80a4 2025 0280 0032 0100 0000 d007 bfd8 80a2 201d 1680 0021 0100 0000 d207 a048 d407 bfdc
0532240 9602 400a d807 bfd8 da4a c00c 9e10 000d 8090 000f 0280 0018 0100 0000 e007 a048 e207 bfdc a404 0011 e607 bfd8 e84c 8013
0532320 aa10 0014 80a5 6025 0280 000f 0100 0000 9027 a020 d207 bfd8 d407 a048 d607 bfdc 9802 800b da07 bfd8 de4b 000d de2a 0009
0532400 e007 bfd8 a204 2001 e227 bfd8 10bf ffdf 0100 0000 a427 a020 e607 bfd8 c02c 8013 d007 a044 4000 3b05 0100 0000 e807 a044
0532460 9005 0008 9227 a020 4000 3adf 0100 0000 1080 014e 0100 0000 c027 bfd4 d007 bfd8 80a2 201d 1680 0030 0100 0000 d207 a048
0532540 d407 bfdc 9602 400a d807 bfd8 da4a c00c 9e10 000d 8090 000f 0280 0027 0100 0000 e007 a048 e207 bfdc a404 0011 e607 bfd8
0532620 d24c 8013 1100 010a 9012 2104 4000 3b4a 0100 0000 8090 0008 1280 001b 0100 0000 d007 a048 d207 bfdc 9402 0009 d607 bfd8
0532700 d84a 800b 9a10 000c 80a3 602a 1280 0005 0100 0000 de07 bfd4 a003 e001 e027 bfd4 a227 a020 e407 bfd8 e607 a048 e807 bfdc
0532760 aa04 c014 ec07 bfd8 ee4d 4016 ee2c 4012 f007 bfd8 b206 2001 f227 bfd8 10bf ffd0 0100 0000 f407 bfd8 80a6 a01d 1680 010f
0533040 0100 0000 f607 a048 f807 bfdc ba06 c01c d007 bfd8 d24f 4008 9410 0009 8090 000a 0280 0106 0100 0000 9027 a020 d207 bfd8
0533120 d407 a048 d607 bfdc 9802 800b da07 bfd8 de4b 000d de2a 0009 e007 bfd8 a204 2001 e227 bfd8 a427 a020 e607 bfd8 c02c 8013
0533200 1080 00ae 0100 0000 d007 a044 4000 3aab 0100 0000 d207 a044 9002 4008 9227 a020 4000 3a85 0100 0000 1080 00ea 0100 0000
0533260 1080 0044 0100 0000 d007 a04c 9002 2004 d027 a04c d202 3ffc d227 bfd0 d007 a044 4000 3a9a 0100 0000 d407 a044 9002 8008
0533340 9227 a020 d407 bfd0 4000 3a73 0100 0000 1080 c03c 0100 0000 d607 a04c 9602 e004 d627 a04c d802 fffc d827 bfd0 da07 a04c
0533420 9a03 6004 da27 a04c de03 7ffc de27 bfcc d007 a044 4000 3a85 0100 0000 e007 a044 9004 0008 9227 a020 d407 bfd0 d607 bfcc
0533500 4000 3a5d 0100 0000 1080 0026 0100 0000 e207 a04c a204 6004 e227 a04c e404 7ffc e427 bfd0 e607 a04c a604 e004 e627 a04c
0533560 e804 fffc e827 bfcc ea07 a04c aa05 6004 ea27 a04c ec05 7ffc ec27 bfc8 d007 a044 4000 3a6a 0100 0000 ee07 a044 9005 c008
0533640 9227 a020 d407 bfd0 d607 bfcc d807 bfc8 4000 3a41 0100 0000 1080 000a 0100 000c d007 bfd4 80a2 2000 02bf ffbc 80a2 2001
0533720 02bf ffca 80a2 2002 02bf ffde 0100 0000 1080 009c 0100 0000 1080 004a 0100 0000 d007 a04c 9002 2008 d027 a04c c102 3ff8
0534000 c302 3ffc c13f bfc0 d007 a044 4000 3a4b 0100 0000 d207 a044 9002 4008 9227 a020 d407 bfc0 d607 bfc4 4000 3a23 0100 0000
0534060 1080 0040 0100 0000 d407 a04c 9402 a004 d427 a04c d602 bffc d627 bfd0 d807 a04c 9803 2008 d827 a04c c503 3ff8 c703 3ffc
0534140 c53f bfc0 d007 a044 4000 3a34 0100 0000 da07 a044 9003 4008 9227 a020 d407 bfd0 d607 bfc0 d807 bfc4 4000 3a0b 0100 0000
0534220 1080 0028 0100 0000 de07 a04c 9e03 e004 de27 a04c e003 fffc e027 bfd0 e207 a04c a204 6004 e227 a04c e404 7ffc e427 bfcc
0534300 e607 a04c a604 e008 e627 a04c c904 fff8 cb04 fffc c93f bfc0 d007 a044 4000 3a17 0100 0000 e807 a044 9005 0008 9227 a020
0534360 d407 bfd0 d607 bfcc d807 bfc0 da07 bfc4 4000 39ed 0100 0000 1080 000a 0100 0000 d007 bfd4 80a2 2000 02bf ffb6 80a2 2001
0534440 02bf ffc6 80a2 2002 02bf ffdc 0100 0000 1080 0048 0100 0000 ea07 bfdc ec07 bfd8 ae05 4016 b025 e001 f207 a048 d04e 4018
0534520 9022 2025 80a2 2053 1880 003e 1500 00b6 9412 a1d0 9332 2004 b410 0009 b52e a002 9202 401a 9202 4008 b610 200f 920a 401b
0534600 992a 6003 d603 000a 80a2 c008 0280 000d 0100 0000 80a2 ffff 0280 002e 0100 0000 9803 2008 980b 2078 d603 000a 80a2 c008
0534660 0280 0004 0100 0000 10bf fff7 0100 0000 9803 000a d003 2004 81c2 0000 0100 0000 0000 0000 0002 d688 0000 0053 0002 d6b0
0534740 0000 0033 0002 d6b0 0000 004e 0002 d6b0 0000 0040 0002 d7e8 0000 0041 0002 d7e8 0000 0042 0002 d7e8 ffff ffff 0002 da50
0535020 0000 0044 0002 d6b0 0000 0050 0002 d6b0 0000 0020 0002 d7e8 ffff ffff 0002 da50 0000 0022 0002 d7e8 0000 003e 0002 d6b0
0535100 0000 003f 0002 d6b0 0000 004a 0002 d6b0 1080 000a 0100 0000 1100 011e 9012 22c8 1300 010a 9212 6113 4000 3999 0100 0000
0535160 4000 3a18 0100 0000 d007 bfdc d207 bfd8 9402 0009 d427 bfdc 10bf fe6c 0100 0000 d007 a044 1080 0003 0100 0000 9010 2000
0535240 b010 0008 81c7 e008 81e8 0000 0000 0000 033f ffff 8200 6398 9de3 8001 f027 a044 f227 a048 f427 a04c f627 a050 f827 a054
0535320 fa27 a058 9007 a044 d027 bffc d207 bffc 9202 6004 d227 bffc d402 7ffc d427 bff8 d007 bff8 d207 bffc 4000 0079 0100 0000
0535400 81c7 e008 81e8 0000 033f ffff 8200 6398 9de3 8001 f027 a044 1100 010a d002 2200 8090 0008 1280 001f 0100 0000 9010 2008
0535460 4000 0d70 0100 0000 d027 bffc d007 bffc 8090 0008 0280 000e 0100 0000 d007 bffc d207 a044 d222 2004 d407 bffc 1700 010a
0535540 d602 e204 d622 8000 d807 bffc 1b00 010a d823 6204 1080 0009 0100 0000 9010 2014 1300 010a 9212 6208 9410 2051 9610 2008
0535620 7fff ffc8 0100 0000 1080 0014 0100 0000 1100 010a d002 2200 d027 bffc 1300 010a d202 6200 d402 4000 1700 010a d422 e200
0535700 d807 bffc da07 a044 da23 2004 de07 bffc 2100 010a e004 2204 e023 c000 e207 bffc 2500 010a e224 a204 81c7 e008 81e8 0000
0535760 033f ffff 8200 6398 9de3 8001 4000 0026 0100 0000 8090 0008 1280 0015 0100 0000 1100 010a d002 2204 d027 bffc d207 bffc
0536040 d402 6004 d427 bff8 d607 bffc d002 c000 1b00 010a d823 6204 de07 bffc 2100 010a e004 2200 e023 c000 e207 bffc 2500 010a
0536120 e224 a200 1080 0009 0100 0000 9010 2001 1300 010a 9212 6217 9410 207c 7fff ff91 0100 0000 c027 bff8 d007 bff8 1080 0003
0536200 0100 0000 9010 2000 b010 0008 81c7 e008 81e8 0000 033f ffff 8200 63c0 9de3 8001 1100 010a d002 2204 8090 0008 1280 0005
0536260 0100 0000 9010 2001 1080 0003 0100 0000 9010 2000 1080 0003 0100 0000 9010 2000 b010 0008 81c7 e008 81e8 0000 033f ffff
0536340 8200 6398 9de3 8001 f027 a044 f227 a048 7fff ffe9 0100 0000 8090 0008 1280 000f 0100 0000 7fff ffbb 0100 0000 d027 bffc
0536420 c207 bffc d007 a044 d207 a048 9fc0 4000 0100 0000 d007 bffc 7fff ff78 0100 0000 1080 0006 0100 0000 d007 a044 d207 a048
0536500 4000 0004 0100 0000 81c7 e008 81e8 0000 033f ffff 8200 63a0 9de3 8001 f027 a044 f227 a048 d007 a044 4000 00b2 0100 0000
0536560 9210 0008 1100 011e 9012 22c8 d407 a048 7fff fc0d 0100 0000 d007 a044 8090 0008 0280 000e 0100 0000 d207 a044 80a2 6001
```

| | | | | | | | | | | | | | | | | | | | | | | | | |
|---|---|---|---|---|---|---|---|---|---|---|---|---|---|---|---|---|---|---|---|---|---|---|---|---|
| 0536640 | 0280 | 000a | 0100 | 0000 | d407 | a044 | 80a2 | a002 | 0280 | 0006 | 0100 | 0000 | d607 | a044 | 80a2 | e003 | 1280 | 0006 | 0100 | 0000 | 4000 | 3942 | 0100 | 0000 |
| 0536720 | 1080 | 0005 | 0100 | 0000 | 9010 | 2001 | 4000 | 38a4 | 0100 | 0000 | 81c7 | e008 | 81e8 | 0000 | 033f | ffff | 8200 | 63a0 | 9de3 | 8001 | f027 | a044 | c207 | a044 |
| 0537000 | 1100 | 010a | 9012 | 2200 | 9210 | 2004 | 9fc0 | 4000 | 0100 | 0000 | c207 | a044 | 1100 | 010a | 9012 | 2204 | 9210 | 2004 | 9fc0 | 4000 | 0100 | 0000 | 81c7 | e008 |
| 0537060 | 81e8 | 0000 | 0000 | 0000 | 033f | ffff | 8200 | 6398 | 9de3 | 8001 | f027 | a044 | 1100 | 010a | d002 | 23cc | 1315 | 5555 | 9212 | 6155 | 941a | 0009 | d427 | bff8 |
| 0537140 | 1700 | 010a | d602 | e3cc | 9822 | e001 | 1b00 | 010a | d823 | 63cc | 1f00 | 010a | 9e13 | e3d0 | de27 | bffc | e007 | bffc | e204 | 0000 | 8090 | 0011 | 0280 | 0015 |
| 0537220 | 0100 | 0000 | d007 | bffc | d202 | 0000 | d402 | 4000 | d607 | bff8 | 80a2 | c00a | 1680 | 0008 | 0100 | 0000 | d807 | bffc | da03 | 0000 | 9e03 | 6008 | de27 | bffc |
| 0537300 | 1080 | 0006 | 0100 | 0000 | e007 | bffc | e204 | 0000 | a404 | 600c | e427 | bffc | 10bf | ffea | 0100 | 0000 | d007 | bff8 | d207 | a044 | 4000 | 000b | 0100 | 0000 |
| 0537360 | e607 | bffc | d024 | c000 | d007 | bff8 | 1080 | 0003 | 0100 | 0000 | 9010 | 2000 | b010 | 0008 | 81c7 | e008 | 81e8 | 0000 | 033f | ffff | 8200 | 6398 | 9de3 | 8001 |
| 0537440 | f027 | a044 | f227 | a048 | 9010 | 2010 | 4000 | 0c71 | 0100 | 0000 | d027 | bffc | d007 | bffc | 8090 | 0008 | 0280 | 002e | 0100 | 0000 | d007 | bffc | d207 | a044 |
| 0537520 | d222 | 0000 | d007 | a048 | 4000 | 3878 | 0100 | 0000 | 9002 | 2001 | 4000 | 0c63 | 0100 | 0000 | d407 | bffc | d022 | a004 | d607 | bffc | d802 | e004 | 8090 | 000c |
| 0537600 | 0280 | 0009 | 0100 | 0000 | da07 | bffc | d003 | 6004 | d207 | a048 | 4000 | 3851 | 0100 | 0000 | 1080 | 0011 | 0100 | 0000 | d007 | a048 | 4000 | 3864 | 0100 | 0000 |
| 0537660 | 9610 | 0008 | 9602 | e001 | 9010 | 2014 | 1300 | 010c | 9212 | 60f5 | 9410 | 2053 | 7fff | feba | 0100 | 0000 | d007 | bffc | 1300 | 010c | 9212 | 6104 | d222 | 2004 |
| 0537740 | d407 | bffc | c022 | a008 | d607 | bffc | c022 | e00c | 1080 | 0009 | 0100 | 0000 | 9010 | 2014 | 1300 | 010c | 9212 | 6105 | 9410 | 205b | 9610 | 2010 | 7fff | fea9 |
| 0540020 | 0100 | 0000 | d007 | bffc | 1080 | 0003 | 0100 | 0000 | 9010 | 2000 | b010 | 0008 | 81c7 | e008 | 81e8 | 0000 | 033f | ffff | 8200 | 6398 | 9de3 | 8001 | f027 | a044 |
| 0540100 | d007 | a044 | 8090 | 0008 | 1680 | 0032 | 0100 | 0000 | 1100 | 010a | d002 | 23d0 | d027 | bffc | d207 | bffc | 8090 | 0009 | 0280 | 0018 | 0100 | 0000 | d407 | bffc |
| 0540160 | d602 | 8000 | d807 | a044 | 80a2 | c00c | 0280 | 0012 | 0100 | 0000 | da07 | bffc | de03 | 4000 | e007 | a044 | 80a4 | 000f | 1680 | 0007 | 0100 | 0000 | e207 | bffc |
| 0540240 | e404 | 6008 | e427 | bffc | 1080 | 0005 | 0100 | 0000 | e607 | bffc | e804 | e00c | e827 | bffc | 10bf | ffe8 | 0100 | 0000 | ea07 | bffc | 8090 | 0015 | 0280 | 0007 |
| 0540320 | 0100 | 0000 | ec07 | bffc | ee05 | a004 | ee27 | bff8 | 1080 | 000a | 0100 | 0000 | 9010 | 2000 | 1300 | 010c | 9212 | 6114 | 9410 | 2082 | d607 | a044 | 7fff | fe6d |
| 0540400 | 0100 | 0000 | c027 | bff8 | 1080 | 0016 | 0100 | 0000 | d007 | a044 | 80a2 | 2022 | 1680 | 000a | 0100 | 0000 | d207 | a044 | 952a | 6002 | 1700 | 010a | 9612 | e340 |
| 0540460 | d802 | 800b | d827 | bff8 | 1080 | 000a | 0100 | 0000 | 9010 | 2000 | 1300 | 010c | 9212 | 6123 | 9410 | 208b | d607 | a044 | 7fff | fe57 | 0100 | 0000 | c027 | bff8 |
| 0540540 | d007 | bff8 | 1080 | 0003 | 0100 | 0000 | 9010 | 2000 | b010 | 0008 | 81c7 | e008 | 81e8 | 0000 | 0000 | 0000 | 033f | ffff | 8200 | 63b8 | 9de3 | 8001 | f027 | a044 |
| 0540620 | f42f | a04f | fa07 | a044 | d04f | a04f | 9210 | c008 | 952a | 6008 | d64f | a04f | 9810 | 000b | 9a13 | 000a | de4f | a04f | a010 | 000f | a32c | 2010 | a413 | 4011 |
| 0540700 | e64f | a04f | a810 | 0013 | ab2d | 2018 | ac14 | 8015 | ec27 | bffc | 80a6 | 6004 | 0880 | 0009 | 0100 | 0000 | 9010 | 001d | d207 | bffc | d222 | 0000 | ba07 | 6004 |
| 0540760 | b226 | 6004 | 10bf | fff8 | 0100 | 0000 | 9406 | 4000 | b226 | 6001 | 8090 | 000a | 0280 | 0007 | 0100 | 0000 | d64f | a04f | d62f | 4000 | ba07 | 6001 | 10bf | fff8 |
| 0541040 | 0100 | 0000 | 81c7 | e008 | 81e8 | 0000 | 033f | ffff | 8200 | 63c0 | 9de3 | 8001 | 1100 | 010c | d002 | 22a4 | 9210 | 0008 | 1100 | 010c | d002 | 22a8 | 9022 | 0009 |
| 0541120 | 1080 | 0003 | 0100 | 0000 | 9010 | 2000 | b010 | 0008 | 81c7 | e008 | 81e8 | 0000 | 033f | ffff | 8200 | 63c0 | 9de3 | 8001 | f027 | a044 | d007 | a044 | 1300 | 010c |
| 0541200 | d202 | 62a4 | 80a2 | 0009 | 0a80 | 000b | 0100 | 0000 | d407 | a044 | 1700 | 010c | d602 | e2a8 | 80a2 | 800b | 1880 | 0005 | 0100 | 0000 | 9010 | 2001 | 1080 | 0003 |
| 0541260 | 0100 | 0000 | 9010 | 2000 | 1080 | 0003 | 0100 | 0000 | 9010 | 2000 | b010 | 0008 | 81c7 | e008 | 81e8 | 0000 | 033f | ffff | 8200 | 63b8 | 9de3 | 8001 | c027 | bffc |
| 0541340 | 1100 | 010d | fa02 | 208c | 8090 | 001d | 0280 | 0008 | 0100 | 0000 | d007 | bffc | 9002 | 2001 | d027 | bffc | fa07 | 6004 | 10bf | fff9 | 0100 | 0000 | d007 | bffc |
| 0541420 | 1080 | 0003 | 0100 | 0000 | 9010 | 2000 | b010 | 0008 | 81c7 | e008 | 81e8 | 0000 | 033f | ffff | 8200 | 63c0 | 9de3 | 8001 | f227 | a048 | d007 | a048 | d202 | 2018 |
| 0541500 | ba10 | 0009 | 8090 | 001d | 0280 | 0011 | 0100 | 0000 | 80a7 | 4018 | 1880 | 000b | 0100 | 0000 | d007 | 6004 | 9210 | 0008 | 9407 | 4009 | 80a6 | 000a | 1a80 | 0005 |
| 0541560 | 0100 | 0000 | 9010 | 2001 | 1080 | 0009 | 0100 | 0000 | fa07 | 4000 | 10bf | fff0 | 0100 | 0000 | 9010 | 2000 | 1080 | 0003 | 0100 | 0000 | 9010 | 2000 | b010 | 0008 |
| 0541640 | 81c7 | e008 | 81e8 | 0000 | 033f | ffff | 8200 | 63a0 | 9de3 | 8001 | 1100 | 010d | d002 | 2094 | 8090 | 0008 | 1680 | 0005 | 0100 | 0000 | 9010 | 2004 | 7fff | fdb9 |
| 0541720 | 0100 | 0000 | 1100 | 010d | d002 | 2090 | 1080 | 0003 | 0100 | 0000 | 9010 | 2000 | b010 | 0008 | 81c7 | e008 | 81e8 | 0000 | 033f | ffff | 8200 | 63c0 | 9de3 | 8001 |
| 0542000 | 1100 | 010d | 9012 | 2044 | 1080 | 0003 | 0100 | 0000 | 9010 | 2000 | b010 | 0008 | 81c7 | e008 | 81e8 | 0000 | 033f | ffff | 8200 | 63a0 | 9de3 | 8001 | f027 | a044 |
| 0542060 | 1100 | 010d | d002 | 2094 | 9002 | 2001 | 1300 | 010d | d022 | 6094 | 80a2 | 2fa0 | 0680 | 0005 | 0100 | 0000 | 9010 | 2005 | 7fff | fd97 | 0100 | 0000 | 1500 | 010d |
| 0542140 | d402 | a094 | 972a | a002 | 1900 | 010d | 9813 | 2098 | 1b00 | 010d | da03 | 6090 | da22 | c00c | de07 | a044 | 2100 | 010d | de24 | 2090 | 81c7 | e008 | 81e8 | 0000 |
| 0542220 | 033f | ffff | 8200 | 6398 | 9de3 | 8001 | 1100 | 010d | d002 | 2094 | 8090 | 0008 | 1680 | 0005 | 0100 | 0000 | 9010 | 2015 | 7fff | fd7f | 0100 | 0000 | 1300 | 010d |
| 0542300 | d202 | 6090 | d227 | bffc | 1500 | 010d | d402 | a094 | 972a | a002 | 1900 | 010d | 9813 | 2098 | da02 | c00c | 1f00 | 010d | da23 | e090 | 2100 | 010d | e004 | 2094 |
| 0542360 | a024 | 2001 | 2300 | 010d | e024 | 6094 | d007 | bffc | 1080 | 0003 | 0100 | 0000 | 9010 | 2000 | b010 | 0008 | 81c7 | e008 | 81e8 | 0000 | 033f | ffff | 8200 | 6398 |
| 0542440 | 9de3 | 8001 | f027 | a044 | f227 | a048 | 9027 | a004 | d207 | a044 | 9410 | 2000 | d607 | a048 | 4000 | 0007 | 0100 | 0000 | d007 | bffc | 7fff | ffb6 | 0100 | 0000 |
| 0542520 | 81c7 | e008 | 81e8 | 0000 | 033f | ffff | 8200 | 63a0 | 9de3 | 8001 | f027 | a044 | f227 | a048 | f427 | a04c | f627 | a050 | d007 | a050 | 80a2 | 2040 | 1480 | 0005 |
| 0542600 | 0100 | 0000 | 1100 | 0007 | 9012 | 23f8 | d027 | a050 | d207 | a044 | 1500 | 012b | d402 | a328 | d422 | 4000 | 8090 | 000a | 1280 | 0009 | 0100 | 0000 | 9010 | 2048 |
| 0542660 | 4000 | 014a | 0100 | 0000 | d607 | a044 | d022 | c000 | 1080 | 0007 | 0100 | 0000 | 1900 | 012b | d803 | 2328 | da03 | 2004 | 1f00 | 012b | da23 | e328 | e007 | a044 |
| 0542740 | e204 | 0000 | 2516 | 2cb0 | a414 | a291 | e424 | 4000 | e607 | a044 | e804 | c000 | 2b20 | 7040 | aa15 | 62bf | ea25 | 2044 | ec07 | a044 | ee05 | 8000 | 3100 | 010d |
| 0543020 | f006 | 208c | f025 | e004 | f207 | a044 | f406 | 4000 | 3700 | 010d | f426 | e08c | f807 | a04c | 8090 | 001c | 0280 | 001d | 0100 | 0000 | d007 | a044 | d202 | 0000 |
| 0543100 | d407 | a04c | d602 | a00c | d622 | 6010 | d807 | a04c | da03 | 200c | 8090 | 000d | 0280 | 0008 | 0100 | 0000 | de07 | a04c | e003 | e00c | e207 | a044 | e404 | 4000 |
| 0543160 | a604 | a010 | e624 | 2014 | e807 | a044 | ea05 | 0000 | ec07 | a04c | ae05 | a00c | ee25 | 6014 | f007 | a04c | f207 | a044 | f406 | 4000 | f426 | 200c | 1080 | 0008 |
| 0543240 | 0100 | 0000 | d007 | a044 | d202 | 0000 | c022 | 6010 | d407 | a044 | d602 | 8000 | c022 | e014 | d807 | a044 | da03 | 0000 | c023 | 6018 | de07 | a044 | e003 | c000 |
| 0543320 | e207 | a050 | e224 | 2024 | e407 | a044 | e604 | 8000 | c024 | e01c | e807 | a044 | ea05 | 0000 | c025 | 6020 | ec07 | a044 | ee05 | 8000 | c025 | e028 | f007 | a044 |
| 0543400 | f206 | 0000 | c026 | 602c | f407 | a044 | f606 | 8000 | c026 | e00c | f807 | a044 | fa07 | 0000 | 1100 | 011c | 9012 | 2318 | d027 | 6040 | d207 | a048 | 8090 | 0009 |
| 0543460 | 1280 | 0008 | 0100 | 0000 | d407 | a044 | d002 | 8000 | 4000 | 0326 | 0100 | 0000 | 1080 | 0006 | 0100 | 0000 | d607 | a044 | d002 | c000 | 4000 | 03fc | 0100 | 0000 |
| 0543540 | 9010 | 2000 | b010 | 0008 | 81c7 | e008 | 81e8 | 0000 | 033f | ffff | 8200 | 63a0 | 9de3 | 8001 | 1100 | 010d | d002 | 2090 | 4000 | 0006 | 0100 | 0000 | 7fff | ff41 |
| 0543620 | 0100 | 0000 | 81c7 | e008 | 81e8 | 0000 | 033f | ffff | 8200 | 63a0 | 9de3 | 8001 | f027 | a044 | d007 | a044 | 4000 | 001a | 0100 | 0000 | d007 | a044 | 1300 | 010d |
| 0543700 | 9212 | 6044 | 80a2 | 0009 | 0280 | 0010 | 0100 | 0000 | d007 | a044 | 4000 | 002f | 0100 | 0000 | d007 | a044 | 9210 | 2048 | 4000 | 0117 | 0100 | 0000 | d007 | a044 |

```
0543760 1300 012b d202 6328 d222 2004 d407 a044 1700 012b d422 c328 9010 2000 b010 0008 81c7 e008 81e8 0000 033f ffff 8200 6398
0544040 9de3 8001 f027 a044 d007 a044 d202 2018 d227 bff8 d407 bff8 8090 000a 0280 0011 0100 0000 d007 bff8 d027 bffc d207 bffc
0544120 d402 4000 d427 bff8 d607 bffc d202 e004 d007 bffc 4000 00f7 0100 0500 d007 bffc 4000 9a2d 0100 0000 10bf ffef 0100 0000
0544200 9010 2000 b010 0008 81c7 e008 81e8 0000 033f ffff 8200 6398 9de3 8001 f027 a044 1100 010d 9012 208c d027 bffc d207 bffc
0544260 d402 4000 8090 000a 0280 0014 0100 0000 d007 bffc d202 0000 d407 a044 80a2 400a 1280 0008 0100 0000 d007 a044 d202 2004
0544340 d407 bffc d222 8000 1080 0011 0100 0000 d607 bffc d802 c000 9a03 2004 da27 bffc 10bf ffeb 0100 0000 9010 2002 1300 011c
0544420 9212 631f 9410 210f 7fff fc66 0100 0000 4000 366c 0100 0000 9010 2000 b010 0008 81c7 e008 81e8 0000 033f ffff 8200 6398
0544500 9de3 8001 8090 0018 1280 0005 0100 0000 9010 2000 1080 0020 0100 0000 9006 2007 920a 3ff8 b010 0009 1500 010d d402 a090
0544560 c202 a03c 9010 0018 1300 010d d202 6090 9fc0 4000 0100 0000 d027 bffc fa07 bffc b136 2003 c027 4000 c027 6004 ba07 6008
0544640 b026 2001 8090 0018 0280 0007 0100 0000 c027 4000 c027 6004 ba07 6008 10bf fff9 0100 0000 d007 bffc 1080 0003 0100 0000
0544720 9010 2000 b010 0008 81c7 e008 81e8 0000 033f ffff 8200 63a0 9de3 8001 f027 a044 d007 a044 8090 0008 1280 0005 0100 0000
0545000 9010 2000 1080 000f 0100 0000 1300 010d 3202 6090 c202 603c d007 a044 9002 2007 900a 3ff8 1300 010d d202 6090 9fc0 4000
0545060 0100 0000 1080 0003 0100 0000 9010 2000 b010 0008 81c7 e008 81e8 0000 033f ffff 8200 63a0 9de3 8001 f027 a044 d007 a044
0545140 8090 0008 0280 001b 0100 0000 1100 010c d002 22ac 8090 0008 0280 000e 0100 0000 d007 a044 1300 010d d202 6090 7fff fe27
0545220 0100 0000 8090 0008 1280 0006 0100 0000 9010 2017 d207 a044 7fff fc02 0100 0000 1100 010d d002 2090 c202 2038 d007 a044
0545300 1300 010d d202 6090 9fc0 4000 0100 0000 81c7 e008 81e8 0000 033f ffff 8200 6398 9de3 8001 f027 a044 d007 a044 4000 0981
0545360 0100 0000 d027 bffc d007 bffc 8090 0008 1280 0018 0100 0300 1100 010c c022 229c 9010 2013 d207 a044 7fff fbe6 0100 0000
0545440 1300 010c d202 629c 8090 0009 0280 0008 0100 0000 d007 a044 4000 096e 0100 0000 d027 bffc 1080 0005 0100 0000 9010 2000
0545520 1080 0039 0100 0000 10bf ffe8 0100 0000 1500 010c d402 a290 8090 000a 0280 0007 0100 0000 d007 bffc d207 a044 9410 2061
0545600 7fff fd80 0100 0000 d607 a044 1900 010c d803 22a0 9803 000b 1b00 010c d823 62a0 de07 a044 a010 000f e207 bffc a404 4010
0545660 e427 bff8 e607 bff8 2900 010c e805 22a8 80a4 c014 1880 0007 0100 0000 2b00 010c ea05 62a8 8090 0015 1280 0005 0100 0000
0545740 d007 bff8 1300 010c d022 62a8 d407 bffc 1700 010c d602 e2a4 80a2 800b 0a80 0007 0100 0000 1900 010c d803 22a4 8090 000c
0546020 1280 0005 0100 0000 d007 bffc 1300 010c d022 62a4 d007 bffc 1080 0003 0100 0000 9010 2000 b010 0008 81c7 e008 81e8 0000
0546100 033f ffff 8200 63a0 9de3 8001 f027 a044 f227 a048 1100 010c d002 2290 8090 0008 0280 0007 0100 0000 d007 a044 d207 a048
0546160 9410 2065 7fff fd43 0100 0000 9010 2000 b010 0008 81c7 e008 81e8 0000 033f ffff 8200 63c0 9de3 8001 9010 2001 1300 010c
0546240 d022 629c 1500 010c d402 a294 1700 010c d602 e290 9812 800b 1b00 010c d823 6298 81c7 e008 81e8 0000 033f ffff 8200 63c0
0546320 9de3 8001 9010 2001 1300 010c d022 6294 1500 010c d402 a294 1700 010c d602 e290 9812 800b 1b00 010c d823 6298 81c7 e008
0546400 81e8 0000 033f ffff 8200 63c0 9de3 8001 4000 0006 0100 0000 4000 0054 0100 0000 81c7 e008 81e8 0000 033f ffff 8200 6398
0546460 9de3 8001 1100 010d d002 2090 4000 001b 0100 0000 1100 010d d002 2094 d027 bffc d207 bffc 8090 0009 0480 0010 0100 0000
0546540 d007 bffc 932a 2002 1500 010d 9412 a098 d602 400a d627 bff8 d007 bff8 4000 000b 0100 0000 d807 bffc 9823 2001 d827 bffc
0546620 10bf fff0 0100 0000 9010 2000 b010 0008 81c7 e008 81e8 0000 033f ffff 8200 63a0 9de3 8001 f027 a044 d007 a044 4000 000c
0546700 0100 0000 8090 0008 1280 0005 0100 0000 9010 2006 7fff fb37 0100 0000 9010 2000 b010 0008 81c7 e008 81e8 0000 033f ffff
0546760 8200 63b8 9de3 8001 f027 a044 1100 010d d002 208c d027 bffc d207 bffc 8090 0009 0280 000f 0100 0000 d407 a044 d607 bffc
0547040 80a2 800b 1280 0005 0100 0000 9010 2001 1080 000b 0100 0000 d807 bffc da03 2004 da27 bffc 10bf fff1 0100 0000 9010 2000
0547120 1080 0003 0100 0000 9010 2000 b010 0008 81c7 e008 81e8 0000 033f ffff 8200 6398 9de3 8001 1100 010d d002 208c d027 bffc
0547200 d207 bffc 8090 0009 0280 000a 0100 0000 d007 bffc 4000 004f 0100 0000 d407 bffc d602 a004 d627 bffc 10bf fff6 0100 0000
0547260 9010 2000 b010 0008 81c7 e008 81e8 0000 033f ffff 8200 63c0 9de3 8001 f027 a044 d007 a044 d202 0000 1516 2cb0 9412 a29d
0547340 80a2 400a 1280 000c 0100 0000 d607 a044 d802 e044 1b20 7040 9a13 62bf 80a3 000d 1280 0005 0100 0000 9010 2001 1080 0003
0547420 0100 0000 9010 2000 1080 0003 0100 0000 9010 2000 b010 0008 81c7 e008 81e8 0000 033f ffff 8200 63a0 9de3 8001 f027 a044
0547500 d007 a044 7fff ffaa 0100 0000 8090 0008 1280 0005 0100 0000 9010 2007 7fff fad5 0100 0000 d007 a044 d202 0000 1516 2cb0
0547560 9412 a29d 80a2 400a 0280 0005 0100 0000 9010 2008 7fff facb 0100 0000 d607 a044 d802 e044 1b20 7040 9a13 62bf 80a3 000d
0547640 0280 0005 0100 0000 9010 2009 7fff fac1 0100 0000 de07 a044 c203 e034 d007 a044 9fc0 4000 0100 0000 81c7 e008 81e8 0000
0547720 033f ffff 8200 63a0 9de3 8001 f027 a044 d007 a044 d202 0000 1516 2cb0 9412 a29d 80a2 400a 0280 0005 0100 0000 9010 2008
0550000 7fff faac 0100 0000 d607 a044 d802 e044 1b20 7040 9a13 62bf 80a3 000d 0280 0005 0100 0000 9010 2009 7fff faa2 0100 0000
0550060 de07 a044 c203 e034 d007 a044 9fc0 4000 0100 0000 9010 2000 b010 0008 81c7 e008 81e8 0000 033f ffff 8200 63a0 9de3 8001
0550140 f027 a044 d007 a044 7fff ff96 0100 0000 8090 0008 1280 000a 0100 0000 9010 2003 1300 011c 9212 6329 9410 21cb 7fff fa89
0550220 0100 0000 4000 348f 0100 0000 d007 a044 d002 2028 1080 0003 0100 0000 9010 2000 b010 0008 81c7 e008 81e8 0000 033f ffff
0550300 8200 63a0 9de3 8001 f027 a044 d007 a044 8090 0008 1280 0006 0100 0000 1100 010d d002 208c 1080 0015 0100 0000 d007 a044
0550360 7fff ff74 0100 0000 8090 0008 1280 000a 0100 0000 9010 2003 1300 011c 9212 6333 9410 21d8 7fff f367 0100 0000 4000 346d
0550440 0100 0000 d007 a044 d002 2004 1080 0003 0100 0000 9010 2000 b010 0008 81c7 e008 81e8 0000 033f ffff 8200 6398 9de3 8001
0550520 f027 a044 c027 bff8 9010 2000 7fff ffd8 0100 0000 d027 bffc d007 bffc 8090 0008 0280 000f 0100 0000 c207 a044 d007 bffc
0550600 9fc0 4000 0100 0000 d207 bff8 9202 4008 d227 bff8 d007 bffc 7fff ffc9 0100 0000 d027 bffc 10bf fff1 0100 0000 d007 bff8
0550660 1080 0003 0100 0000 9010 2000 b010 0008 81c7 e008 81e8 0000 033f ffff 8200 63c0 9de3 8001 f027 a044 f227 a048 d007 a044
0550740 d207 a048 9022 0009 1080 0003 0100 0000 9010 2000 b010 0008 81c7 e008 81e8 0000 033f ffff 8200 63c0 9de3 8001 f027 a044
0551020 d007 a044 9210 0008 ba10 0009 953f 601d ba1f 400a 972f 6017 ba1f 400b 993f 6013 ba1f 400c 9b2f 6011 ba1f 400d 9f3f 600d
```

```
0551100  ba1f 400f a12f 600b ba1f 4010 a33f 6007 ba1f 4011 a52f 6005 ba1f 4012 a73f 6003 ba1f 4013 a92f 6001 ba1f 4014 9010 001d
0551160  1080 0003 0100 0000 9010 2000 b010 0008 81c7 e008 81e8 0000 033f ffff 8200 6390 9de3 8001 f027 a044 f227 a048 d007 a044
0551240  d027 bff4 d207 a048 d227 bff8 c027 bffc d407 bff8 d64a 8000 9810 000b 8090 000c 0280 000a 0100 0000 da07 bff8 9a03 6001
0551320  da27 bff8 de07 bffc 9e03 e001 de27 bffc 10bf fff4 0100 0000 d007 a044 7fff fc4d 0100 0000 d007 bffc 9002 2001 912a 2002
0551400  7fff fdb8 0100 0000 e007 bff4 d024 2040 7fff fc60 0100 0000 e207 bff4 e404 6040 e427 bff8 e607 bff8 a604 e001 e627 bff8
0551460  a824 e001 ea07 a048 aa05 6001 ea27 a048 ac25 6001 ee4d 8000 ee2d 0000 b010 0017 8090 0018 0280 0004 0100 0000 10bf fff2
0551540  0100 0000 81c7 e008 81e8 0000 033f ffff 8200 63c0 9de3 8001 f027 a044 d007 a044 d002 2040 1080 0003 0100 0000 9010 2000
0551620  b010 0008 81c7 e008 81e8 0000 033f ffff 8200 63c0 9de3 8001 9010 2001 1300 010c d022 62ac 81c7 e008 81e8 0000 033f ffff
0551700  8200 63c0 9de3 8001 1100 010c c022 22ac 81c7 e008 81e8 0000 033f ffff 8200 63c0 9de3 8001 f027 a044 d007 a044 1300 00bd
0551760  9212 6294 d222 2034 d407 a044 1700 00bd 9612 e210 d622 a038 d807 a044 1b00 00bd 9a13 6020 da23 203c 81c7 e008 81e8 0000
0552040  033f ffff 8200 6398 9de3 8001 1100 010c d002 2298 8090 0008 0280 002c 0100 0000 1100 010c d002 2294 8090 0008 0280 0004
0552120  0100 0000 f027 bffc b006 200c d006 6020 9210 0008 80a6 0009 0a80 0006 0100 0000 9010 0018 9210 0019 4000 0038 0100 0000
0552200  d406 601c d427 bff8 9610 0018 d806 601c 9803 000b d826 601c da06 6020 9a23 4018 da26 6020 de06 6028 9e03 c018 de26 6028
0552260  2100 010c e004 2294 8090 0010 0280 0009 0100 0000 d007 bffc 9210 0008 d007 bff8 9002 0009 9210 0019 4000 0057 0100 0000
0552340  1080 0017 0100 0000 d006 6020 9210 0008 80a6 0009 0a80 0006 0100 0000 9010 0018 9210 0019 4000 0015 0100 0000 d406 601c
0552420  d427 bff8 9610 0018 d806 601c 9803 000b d826 601c da06 6020 9a23 4018 da26 6020 de06 6028 9e03 c018 de26 6028 d007 bff8
0552500  1080 0003 0100 0000 9010 2000 b010 0008 81c7 e008 81e8 0000 033f ffff 8200 6390 9de3 8001 f027 a044 f227 a048 d007 a048
0552560  d202 2024 9410 0009 d607 a044 80a2 c00a 0880 0005 0100 0000 d807 a044 1080 0004 0100 0000 da07 a048 d803 6024 d827 bff8
0552640  de07 bff8 a003 e008 e027 bff4 d007 bff4 7fff f14a 0100 0000 d027 bffc e207 a048 e404 6018 e607 bffc e424 c000 e807 a048
0552720  ea07 bffc ea25 2018 ec07 bffc ee07 bff4 ee25 a004 f007 a048 f207 bff8 f226 2020 f407 a048 f607 bffc b806 e008 f826 a01c
0553000  9010 2000 b010 0008 81c7 e008 81e8 0000 033f ffff 8200 63c0 9de3 8001 f027 a044 f227 a048 9010 2000 b010 0008 81c7 e008
0553060  81e8 0000 033f ffff 8200 63c0 9de3 8001 f027 a044 f227 a048 d007 a044 1314 d58a 9212 6146 d222 0000 d407 a044 172a f355
0553140  9612 e124 d622 a008 d807 a044 da07 a048 de03 602c de23 2004 e007 a048 e207 a044 e224 202c 9010 2000 b010 0008 81c7 e008
0553220  81e8 0000 033f ffff 8200 6398 9de3 8001 f027 a044 1100 010c d002 2294 8090 0008 0280 0022 0100 0000 d007 a044 d202 202c
0553300  d227 bffc d407 bffc 8090 000a 0280 001b 0100 0000 d007 bffc d202 0000 1514 d58a 9412 a146 80a2 400a 0280 0005 0100 0000
0553360  9010 200a 7fff f8ef 0100 0000 d007 bffc d202 2008 152a f355 9412 a124 80a2 400a 0280 0005 0100 0000 9010 200b 7fff f8e5
0553440  0100 0000 d607 bffc d802 e004 d827 bffc 10bf ffe5 0100 0000 9010 2000 b010 0008 81c7 e008 81e8 0000 033f ffff 8200 63a0
0553520  9de3 8001 f027 a044 d007 a044 1300 00bf 9212 63e0 d222 2034 d407 a044 1700 00bf 9612 e144 d622 a038 d807 a044 1b00 00bd
0553600  9a13 63f4 da23 203c d007 a044 9002 2030 d207 a044 4000 0004 0100 0000 81c7 e008 81e8 0000 033f ffff 8200 63a0 9de3 8001
0553660  f027 a044 f227 a048 d007 a044 9210 2194 d407 a048 4000 00fb 0100 0000 d007 a044 d002 0000 9210 2194 9410 2000 7fff fa69
0553740  0100 0000 9010 2000 b010 0008 81c7 e008 81e8 0000 033f ffff 8200 6390 9de3 8001 f027 a044 f227 a048 1100 010c d002 2298
0554020  8090 0008 0280 0048 0100 0000 1100 010c d002 2294 8090 0008 0280 001f 0100 0000 d007 a044 d027 bffc d207 a044 9202 6010
0554100  d227 a044 d007 a044 d207 a048 4000 004d 0100 0000 ba10 0008 9407 6004 d427 bff4 d607 4000 9822 e010 d827 bff8 da07 bff8
0554160  9e10 000d d007 bff4 9002 000f d207 a048 4000 019b 0100 0000 e007 a048 e207 bff8 e404 2028 a404 8011 e424 2028 1080 000e
0554240  0100 0000 d007 a044 d207 a048 4000 0035 0100 0000 ba10 0008 9007 6004 d027 bff4 d207 a048 d407 4000 d602 6028 9602 c00a
0554320  d622 6028 1900 010c d803 2290 8090 000c 0280 0013 0100 0000 1100 010c d002 2294 8090 0008 0280 0009 0100 0000 d007 bff4
0554400  d207 bffc 9410 2061 7fff fa1e 0100 0000 1080 0007 0100 0000 d007 bff4 d207 a044 9410 2061 7fff fa17 0100 0000 1080 000e
0554460  0100 0000 d007 a044 d207 a048 4000 0011 0100 0000 ba10 0008 9007 6004 d027 bff4 d207 a048 d407 4000 d602 6028 9602 c00a
0554540  d622 6028 d007 bff4 1080 0003 0100 0000 9010 2000 b010 0008 81c7 e008 81e8 0000 033f ffff 8200 6398 9de3 8001 f027 a044
0554620  f227 a048 d007 a044 80a2 2190 1a80 000a 0100 0000 d207 a048 d202 6030 d007 a044 4000 001b 0100 0000 d027 bffc 1080 0008
0554700  0100 0000 d407 a048 d202 a030 d007 a044 4000 002c 0100 0000 d027 bffc d607 bffc 8090 000b 1280 0007 0100 0000 9027 a004
0554760  d207 a044 d407 a048 4000 005a 0100 0000 d007 bffc 1080 0003 0100 0000 9010 2000 b010 0008 81c7 e008 81e8 0000 033f ffff
0555040  8200 63c0 9de3 8001 f027 a044 f227 a048 d007 a044 9332 2002 9410 0009 972a a002 d807 a048 9a03 000b ba10 000d f807 4000
0555120  8090 001c 0280 0004 0100 0000 de07 2004 de27 4000 9010 001c 1080 0003 0100 0000 9010 2000 b010 0008 81c7 e008 81e8 0000
0555200  033f ffff 8200 63b0 9de3 8001 f227 a048 c027 bff8 d007 a048 d202 2190 d227 bffc 9427 a008 ba10 000a c027 bff4 972e 2001
0555260  b410 000b f807 6004 8090 001c 0280 0017 0100 0000 f607 0000 9010 001b 80a6 0008 1880 000f 0100 0000 80a6 c01a 1680 000c
0555340  0100 0000 f827 bff4 fa27 bff0 d007 bff4 d202 0000 b410 0009 80a6 c01a 1280 0004 0100 0000 1080 0005 0100 0000 ba10 001c
0555420  10bf ffe9 0100 0000 d407 bff4 8090 000a 0280 0009 0100 0000 d007 bff0 d207 bff4 d402 6004 d422 2004 d607 a048 d807 bffc
0555500  d822 e190 d007 bff4 1080 0003 0100 0000 9010 2000 b010 0008 81c7 e008 81e8 0000 033f ffff 8200 63a0 9de3 8001 f027 a044
0555560  f227 a048 f427 a04c d207 a048 9202 6004 d007 a044 d407 a04c 4000 000a 0100 0000 d007 a044 d202 0000 d407 a048 d422 4000
0555640  9010 2000 b010 0008 81c7 e008 81e8 0000 033f ffff 8200 63a0 9de3 8001 f027 a044 f227 a048 f427 a04c d007 a04c d202 2020
0555720  9410 0009 d607 a048 80a2 c00a 0a80 0006 0100 0000 d007 a048 d207 a04c 4000 0015 0100 0000 d807 a04c da03 201c de07 a044
0556000  da23 c000 e007 a04c e207 a048 a410 0011 e604 201c a604 c012 e624 201c e807 a04c ea07 a048 ec05 2020 ac25 8015 ec25 2020
0556060  9010 2000 b010 0008 81c7 e008 81e8 0000 033f ffff 8200 6390 9de3 8001 f027 a044 f227 a048 d007 a048 d202 2020 80a2 6004
0556140  0480 0010 0100 0000 d007 a048 d202 201c d227 bffc d407 a048 d602 a020 9822 e004 9a10 000c de07 bffc da23 c000 e007 a048
```

```
0556220 d004 2030 d207 bffc 4000 0066 0100 0000 e207 a048 e404 6024 a610 0012 e807 a044 80a5 0013 0880 0005 0100 0000 ea07 a044
0556300 1080 0004 0100 0000 ec07 a048 ea05 a024 ea27 bff4 ee07 bff4 b005 e008 f027 bff0 d007 bff0 7fff fb7d 0100 0000 d027 bff8
0556360 f207 a048 f406 6018 f607 bff8 f426 c000 f807 a048 fa07 bff8 fa27 2018 d007 bff8 d207 bff0 d222 2004 d407 a048 d607 bff4
0556440 d622 a020 d807 a048 da07 bff8 9e03 6008 de23 201c 9010 2000 b010 0008 81c7 e008 81e8 0000 033f ffff 8200 63a0 9de3 8001
0556520 f027 a044 d007 a044 9222 2004 ba10 0009 1500 010c d402 a298 8090 000a 0280 0025 0100 0000 1100 010c d002 2294 8090 0008
0556600 0280 0010 0100 0000 d007 4000 9210 0008 d007 a044 9102 0009 9022 2010 4000 007a 0100 0000 d407 4000 9622 a010 d806 6028
0556660 9823 000b d826 6028 1080 0006 0100 0000 da07 4000 de06 6028 9e23 c00d de26 6028 2100 010c e004 2290 8090 0010 0280 0007
0556740 0100 0000 d007 a044 d207 4000 9410 2066 7fff f8e4 0100 0000 1080 0006 0100 0000 e207 4000 e406 6028 a424 8011 e426 6028
0557020 d006 6030 9210 001d 4000 0006 0100 0000 9010 2000 b010 0008 81c7 e008 81e8 0000 033f ffff 8200 6398 9de3 8001 f027 a044
0557100 f227 a048 d007 a048 d202 0000 d227 bffc d407 bffc 80a2 a190 1680 000c 0100 0000 d607 bffc 993a e002 9b2b 2002 d007 a044
0557160 9002 000d d207 a048 4000 000d 0100 0000 1080 0007 0100 0000 d007 a044 9002 2190 d207 a048 4000 0006 0100 0000 9010 2000
0557240 b010 0008 81c7 e008 81e8 0000 033f ffff 9200 63c0 9de3 8001 f027 a044 f227 a048 d007 a048 d207 a044 d402 4000 d422 2004
0557320 d607 a044 d807 a048 d822 c000 9010 2000 b010 0008 81c7 e008 81e8 0000 033f ffff 8200 63b8 9de3 8001 f027 a044 f227 a048
0557400 d007 a044 1314 d58a 9212 6146 d222 0000 d407 a044 172a f355 9612 e124 d622 a00c d807 a048 da03 202c da27 bffc de07 bffc
0557460 8090 000f 0280 0006 0100 0000 e007 bffc e207 a044 a404 6008 e424 2004 e607 a044 e807 bffc e824 e008 ea07 a048 ec07 a044
0557540 ec25 602c ee07 a044 f007 a048 b206 202c f225 e004 9010 2000 b010 0009 81c7 e008 81e8 0000 033f ffff 8200 63b8 9de3 8001
0557620 f027 a044 d007 a044 d202 2008 d227 bffc d407 bffc 8090 000a 0280 0006 0100 0000 d607 bffc d807 a044 da03 2004 da22 e004
0557700 de07 a044 e003 e004 e207 bffc e224 0000 9010 2000 b010 0008 81c7 e008 81e8 0000 033f ffff 8200 6398 9de3 8001 f027 a044
0557760 1100 010c d002 2294 8090 0008 0280 002c 0100 0000 d007 a044 d202 202c d227 bffc d407 bffc 8090 000a 0280 0025 0100 0000
0560040 d007 bffc d202 0000 1514 d58a 9412 a146 80a2 400a 0280 0005 0100 0000 9010 200a 7fff f69c 0100 0000 d007 bffc d202 200c
0560120 152a f355 9412 a124 80a2 400a 0280 0005 0100 0000 9010 2005 7fff f692 0100 0000 d607 bffc d802 e004 da03 0000 de07 bffc
0560200 80a3 400f 0280 0005 0100 0000 9010 200c 7fff f688 0100 0000 e007 bffc e204 2008 e227 bffc 10bf ffdb 0100 0000 d007 a044
0560260 4000 0006 0100 0000 9010 2000 b010 0008 81c7 e008 81e8 0000 033f ffff 8200 6398 9de3 8001 f027 a044 d007 a044 d202 2030
0560340 d227 bffc 9410 2004 d427 bff8 d607 bff8 80a2 e190 1680 0010 0100 0000 d807 bff8 9b3b 2002 9f2b 6002 e007 bffc d004 000f
0560420 d207 bff8 d407 a044 4000 0010 0100 0000 e207 bff8 a204 6004 e227 bff3 10bf fff0 0100 0000 e407 bffc d004 a190 d207 a044
0560500 4000 0047 0100 0000 9010 2000 b010 0008 81c7 e008 81e8 0000 033f ffff 8200 6398 9de3 8001 f027 a044 f227 a048 f427 a04c
0560560 d007 a044 d027 bffc d207 bffc 8090 0009 0280 000c 0100 0000 d007 bffc d207 a048 d407 a04c 4000 000b 0100 0000 d407 bffc
0560640 d602 a004 d627 bffc 10bf fff4 0100 0000 9010 2000 b010 0008 81c7 e008 81e8 0000 033f ffff 8200 63a0 9de3 8001 f027 a044
0560720 f227 a048 f427 a04c d007 a048 9210 0008 d407 a044 d602 8000 80a2 c009 0280 0005 0100 0000 9010 200d 7fff f62e 0100 0000
0561000 d807 a044 da03 2004 de07 a044 80a3 400f 1280 0005 0100 0000 9010 200e 7fff f625 0100 0000 d007 a044 d207 a04c 7fff f83f
0561060 0100 0000 8090 0008 1280 0005 0100 0000 9010 200f 7fff f61b 0100 0000 9010 2000 b010 0008 81c7 e008 81e8 0000 033f ffff
0561140 8200 6398 9de3 8001 f027 a044 f227 a048 d007 a044 d027 bffc d207 bffc 8090 0009 0280 000b 0100 0000 d007 bffc d207 a048
0561220 4000 000b 0100 0000 d407 bffc d602 a004 d627 bffc 10bf fff5 0100 0000 9010 2000 b010 0008 81c7 e008 81e8 0000 033f ffff
0561300 8200 63a0 9de3 8001 f027 a044 f227 a048 d007 a044 d202 0000 80a2 6190 1a80 0005 0100 0000 9010 2010 7fff f5f2 0100 0000
0561360 d407 a044 d602 a004 d807 a044 80a2 c00c 1280 0005 0100 0000 9010 2011 7fff f5e9 0100 0000 d007 a044 d207 a048 7fff f803
0561440 0100 0000 8090 0008 1280 0005 0100 0000 9010 2012 7fff f5df 0100 0000 9010 2000 b010 0008 81c7 e008 81e8 0000 0000 0000
0561520 033f ffff 8200 6398 9de3 8001 f027 a044 f227 a048 f427 a04c f627 a050 f827 a054 9010 2024 7fff f99b 0100 0000 d027 bffc
0561600 d007 bffc d207 a044 d222 2004 d407 bffc d607 a048 d622 a008 d807 bffc da07 a04c da23 200c de07 bffc e007 a050 e023 e010
0561660 e207 bffc c024 6014 e407 bffc c024 a01c e607 bffc c024 e020 7fff f7f8 0100 0000 e807 bffc d025 2018 ea07 bffc 2d00 011d
0561740 ac15 a2cc ec25 4000 d007 bffc 1080 0003 0100 0000 9010 2000 b010 0008 81c7 e008 81e8 0000 033f ffff 8200 63a0 9de3 8001
0562020 f027 a044 1100 00bc 9012 2200 1300 00bc 9212 61c8 9410 2000 9610 2000 d807 a044 7fff ffc8 0100 0000 1080 0003 0100 0000
0562100 9010 2000 b010 0008 81c7 e008 81e8 0000 033f ffff 8200 63a0 9de3 8001 f027 a044 1100 00c5 9012 234c 1300 00f0 9212 6120
0562160 1500 00c6 9412 a38c 9610 2000 d807 a044 7fff ffb4 0100 0000 1080 0003 0100 0000 9010 2000 b010 0008 81c7 e008 81e8 0000
0562240 033f ffff 8200 6398 9de3 8001 f027 a044 d007 a044 d027 bffc d207 bffc d002 6018 7fff f7d8 0100 0000 d407 bffc d602 a01c
0562320 8090 000b 0280 001a 0100 0000 d007 bffc d202 201c d227 bff8 d407 bffc d607 bffc d802 e01c da03 2014 da22 a01c de07 bffc
0562400 e003 e010 8090 0010 0280 0008 0100 0000 d007 bffc c202 2010 d207 bff8 d002 4000 9fc0 4000 0100 0000 d007 bff8 7fff f948
0562460 0100 0000 10bf ffe5 0100 0000 d007 bffc 7fff f943 0100 0000 7fff f7d2 0100 0000 81c7 e008 81e8 0000 033f ffff 8200 6398
0562540 9de3 8001 f027 a044 f227 a048 d007 a044 d027 bffc d007 bffc 7fff f73c 0100 0000 8090 0008 0280 0009 0100 0000 d207 bffc
0562620 d402 4000 1700 011d 9612 e2cc 80a2 800b 0280 0007 0100 0000 9010 201c 1300 011d 9212 6310 7fff f53f 0100 0000 d007 bffc
0562700 c202 2004 d007 a048 9fc0 4000 0100 0000 ba10 0008 d207 bffc d402 6014 b810 000a 8090 001c 1280 0005 0100 0000 9010 2000
0562760 1080 0020 0100 0000 d007 2004 80a7 4008 1680 0005 0100 0000 f807 200c 1080 0016 0100 0000 d007 2004 80a7 4008 0480 0005
0563040 0100 0000 f807 2010 1080 000f 0100 0000 d007 bffc c202 2008 d007 a048 d207 0000 9fc0 4000 0100 0000 8090 0008 1280 0005
0563120 0100 0000 9010 2001 1080 0006 0100 0000 f807 200c 10bf ffdf 0100 0000 9010 2000 b010 0008 81c7 e008 81e8 0000 033f ffff
0563200 8200 6398 9de3 8001 f027 a044 f227 a048 d007 a044 d027 bffc d007 bffc 7fff f6f3 0100 0000 8090 0008 0280 0009 0100 0000
0563260 d207 bffc d402 4000 1700 011d 9612 e2cc 80a2 800b 0280 0007 0100 0000 9010 201c 1300 011d 9212 631e 7fff f4f6 0100 0000
```

0563340 d007 bffc c202 2004 d007 a048 9fc0 4000 0100 0000 ba10 0008 d207 bffc d402 6014 b810 000a 8090 001c 1280 0005 0100 0000
0563420 9010 2000 1080 0020 0100 0000 d007 2004 80a7 4008 1680 0005 0100 0000 f807 200c 1040 0016 0100 0000 d007 2004 80a7 4008
0563500 0480 0005 0100 0000 f807 2010 1080 000f 0100 0000 d007 bffc c202 2008 d007 a048 d207 0000 9fc0 4000 0100 0000 8090 0008
0563560 1280 0005 0100 0000 d007 2008 1080 0006 0100 0000 f807 200c 10bf ffdf 0100 0000 9010 2000 b010 0008 81c7 e008 81e8 0000
0563640 033f ffff 8200 63a0 9de3 8001 f027 a044 f227 a048 f427 a04c d007 a044 7fff f6ab 0100 0000 8090 0008 0280 0009 0100 0000
0563720 d007 a044 d202 0000 1500 011d 9412 a2cc 80a2 400a 0280 0007 0100 0000 9010 201c 1300 011d 9212 632d 7fff f4ae 0100 0000
0564000 d007 a044 d207 a048 d407 a04c 9610 2000 4000 002c 0100 0000 1080 0003 0100 0000 9010 2000 b010 0008 81c7 e008 81e8 0000
0564060 033f ffff 8200 63a0 9de3 8001 f027 a044 f227 a048 f427 a04c d007 a044 7fff f687 0100 0000 8090 0008 0280 0009 0100 0000
0564140 d007 a044 d202 0000 1500 011d 9412 a2cc 80a2 400a 0280 0007 0100 0000 9010 201c 1300 011d 9212 633f 7fff f48a 0100 0000
0564220 d007 a044 d207 a048 d407 a04c 9610 2001 4000 0038 0100 0000 1080 0003 0100 0000 9010 2000 b010 0008 81c7 e008 81e8 0000
0564300 033f ffff 8200 63a0 9de3 8001 f027 a044 f227 a048 f427 a04c f627 a050 d007 a044 c202 2004 d007 a048 9fc0 4000 0100 0000
0564360 ba10 0008 d207 a044 9402 6014 b810 000a d007 0000 8090 0008 1280 003c 0100 0000 d007 a044 d002 2018 7fff f6c2 0100 0000
0564440 d207 a044 d402 6020 9402 a001 d422 6020 9010 201c 7fff f82b 0100 0000 d027 0000 b610 0008 d607 a044 d802 e00c 8090 000c
0564520 1280 0006 0100 0000 d007 a048 d026 c000 1080 0008 0100 0000 d007 a044 c202 200c d007 a048 9fc0 4000 0100 0000 d026 c000
0564600 fa26 e004 d207 a04c d226 e008 c026 e010 9410 2000 d426 e00c d607 a044 d802 e01c d826 e014 c026 e018 da07 a044 f623 601c
0564660 de06 e014 8090 000f 0280 0004 0100 0000 d006 e014 f622 2018 7fff f6b2 0100 0000 d207 a050 8090 0009 1280 0005 0100 0000
0564740 9010 2001 1080 0003 0100 0000 9010 2000 1080 0030 0100 0000 d407 0000 d602 a004 80a7 400b 1680 0007 0100 0000 d007 0000
0565020 9202 200c b810 0009 1080 0023 0100 0000 d407 0000 d602 a004 80a7 400b 0480 0007 0100 0000 d007 0000 9202 2010 b810 0009
0565100 1080 0019 0100 0000 d407 a044 c202 a008 d607 0000 d202 c000 d007 a048 9fc0 4000 0100 0000 8090 0008 1280 000c 0100 0000
0565160 d007 a050 8090 0008 0280 0005 0100 0000 d007 0000 d207 a04c d222 2008 d007 a050 1080 0008 0100 0000 d007 0000 9202 200c
0565240 b810 0009 10bf ff97 0100 0000 9010 2000 b010 0008 81c7 e008 81e8 0000 033f ffff 8200 6398 9de3 8001 f027 a044 f227 a048
0565320 d007 a044 d027 bffc d007 bffc 7fff f5e3 0100 0000 8090 0008 0280 0009 0100 0000 d207 bffc d402 4000 1700 011d 9612 e2cc
0565400 80a2 800b 0280 0007 0100 0000 9010 201c 1300 011d 9212 6352 7fff f3e6 0100 0000 d007 bffc c202 2004 d007 a048 9fc0 4000
0565460 0100 0000 ba10 0008 d207 bffc 9402 6014 b810 000a d007 0000 8090 0008 1280 0005 0100 0000 c027 bff8 1080 0053 0100 0000
0565540 d007 0000 d202 2004 80a7 4009 1680 0007 0100 0000 d007 0000 9202 200c b810 0009 1080 0047 0100 0000 d407 0000 d602 a004
0565620 80a7 400b 0480 0007 0100 0000 d007 0000 9202 2010 b810 0009 1080 003d 0100 0000 d407 bffc c202 a008 d607 0000 d202 c000
0565700 d007 a048 9fc0 4000 0100 0000 8090 0008 1280 0030 0100 0000 d007 0000 d202 2008 d227 bff8 d407 0000 d602 a014 8090 000b
0565760 0280 0007 0100 0000 d007 0000 d202 2014 d407 0000 d602 a018 d622 6018 d807 0000 da03 2018 8090 0004 0280 0009 0100 0000
0566040 d007 0000 d202 2018 d407 0000 d602 a014 d622 6014 1080 0006 0100 0000 d007 bffc d207 0000 d402 6014 d422 201c d607 bffc
0566120 d002 e018 7fff f5f3 0100 0000 d807 bffc da03 2020 9a23 6001 da23 2020 de07 bffc d003 e010 9210 001c 4000 0012 0100 0000
0566200 7fff f604 0100 0000 1080 0007 0100 0000 d007 0000 9202 200c b810 0009 10bf ffaa 0100 0000 d007 bff8 1080 0003 0100 0000
0566260 9010 2000 b010 0008 81c7 e008 81e8 0000 033f ffff 8200 6390 9de3 8001 f027 a044 d006 4000 d027 bffc d206 4000 d402 600c
0566340 8090 000a 1280 0007 0100 0000 d006 4000 d202 2010 d226 4000 1080 0035 0100 0000 d406 4000 d602 a010 8090 000b 1280 0007
0566420 0100 0000 d006 4000 d202 200c d226 4000 1080 002b 0100 0000 d006 4000 9202 2010 d227 bff8 d407 bff8 d602 8000 d802 e00c
0566500 8090 000c 0280 0008 0100 0000 d007 bff8 d202 0000 9402 600c d427 bff8 10bf fff6 0100 0000 d607 bff8 d802 c000 d827 bff4
0566560 da07 bff8 de03 4000 e003 e010 e207 bff8 e024 4000 e407 bff4 e606 4000 e804 e00c e824 a00c ea07 bff4 ec06 4000 ee05 a010
0566640 ee25 6010 f007 bff4 f406 2010 f607 bff4 80a6 801b 1280 0004 0100 0000 d007 bff4 c022 2010 d207 bff4 d226 4000 d407 a044
0566720 8090 000a 0280 0007 0100 0000 c207 a044 d007 bffc d002 0009 9fc0 4000 0100 0000 d007 bffc 7fff f716 0100 0000 81c7 e008
0567000 81e8 0000 033f ffff 8200 6398 9de3 8001 f027 a044 f227 a048 f427 a04c f627 a050 d007 a044 7fff f511 0100 0000 8090 0008
0567060 0280 0009 0100 0000 d007 a044 d202 0000 1500 011d 9412 a2cc 80a2 400a 0280 0007 0100 0000 9010 201c 1300 011d 9212 6364
0567140 7fff f314 0100 0000 d007 a048 8090 0008 1280 0007 0100 0000 d007 a044 d202 201c d227 bffc 1080 0005 0100 0000 d007 a048
0567220 d202 2014 d227 bffc d407 bffc 8090 000a 0280 000d 0100 0000 d007 a04c d207 bffc d402 4000 d422 0030 d607 bffc d802 e008
0567300 da07 a050 d823 4000 d007 bffc 1080 000b 0100 0000 d007 a04c d207 a050 c022 4000 9410 2000 d422 0000 d007 bffc 1080 0003
0567360 0100 0000 9010 2000 b010 0008 81c7 e008 81e8 0000 033f ffff 8200 63a0 9de3 8001 f027 a044 d007 a044 7fff f4d4 0100 0000
0567440 8090 0008 0280 0009 0100 0000 d007 a044 d202 0000 1500 011d 9412 a2cc 80a2 400a 0280 0007 0100 0000 9010 201c 1300 011d
0567520 9212 6378 7fff f2d7 0100 0000 d007 a044 d002 2020 1080 0003 0100 0000 9010 2000 b010 0008 81c7 e008 81e8 0000 033f ffff
0567600 8200 6398 9de3 8001 f027 a044 9010 2001 d027 bff8 d007 a044 d027 bffc d007 bffc 7fff f4b2 0100 0000 8090 0008 1280 0008
0567660 0100 0000 9010 201b 7fff f2be 0100 0000 9010 2000 1080 002a 0100 0000 d007 bffc d202 0000 1500 011d 9412 a2cc 80a2 400a
0567740 0280 0006 0100 0000 9010 2018 7fff f2b1 0100 0000 c027 bff8 d007 bffc d002 2018 7fff f7b0 0100 0000 8090 0008 1280 0008
0570020 0100 0000 9010 2019 7fff f2a6 0100 0000 c027 bff8 1080 000e 0100 0000 d007 bffc d202 2018 d007 bffc 7fff f4bc 0100 0000
0570100 8090 0008 1280 0006 0100 0000 9010 201a 7fff f298 0100 0000 c027 bff8 d007 bff8 1080 0003 0100 0000 9010 2000 b010 0008
0570160 81c7 e008 81e8 0000 033f ffff 8200 6398 9de3 8001 f027 a044 d007 a044 d027 bffc d007 bffc 7fff f475 0100 0000 8090 0008
0570240 0280 000c 0100 0000 d207 bffc d402 400c 1700 011d 9612 e2cc 80a2 800b 1280 0005 0100 0000 9010 2001 1080 0003 0100 0000
0570320 9010 2000 1080 0003 0100 0000 9010 2000 b010 0008 81c7 e008 81e8 0000 0000 0000 033f ffff 8200 63a0 9de3 8001 f027 a044
0570400 d007 a044 4000 2c43 0100 0000 1080 0003 0100 0000 9010 2000 b010 0008 81c7 e008 81e8 0000 033f ffff 8200 63a0 9de3 8001

```
0570460 f027 a044 d007 a044 4000 2c3c 0100 0000 81c7 e008 81e8 0000 033f ffff 8200 63b8 9de3 8001 1100 011e d002 216c 8090 0008
0570540 1280 00a6 0100 0000 c027 bff8 d007 bff8 80a2 2100 1680 002a 0100 0000 d007 bff8 1300 012d 9212 6230 c02a 0009 d407 bff8
0570620 1700 012b 9612 e330 c02a 800b d807 bff8 1b00 012c 9a13 6039 c02b 000d de07 bff8 2100 012c a014 2130 e207 bff8 e22b c010
0570700 e407 bff8 2700 012c a614 e230 e807 bff8 e82c 8013 ea07 bff8 2d00 012c ac15 a330 c02d 4016 ee07 bff8 3100 012d b016 2030
0570760 c02d c018 f207 bff8 3500 012d b416 a130 b610 3fff f62e 401a f807 bff8 b807 2001 f827 bff8 10bf ffd6 0100 0000 3b00 011e
0571040 ba17 6158 fa27 bffc d007 bffc d24a 0000 9410 0009 8090 000a 0280 000f 0100 0000 d007 bffc d24a 0000 9410 0009 960a a0ff
0571120 1900 012d 9813 2230 9a10 2001 da2a c00c de07 bffc 9e03 e001 de27 bffc 10bf ffef 0100 0000 2100 011e a014 2120 e027 bffc
0571200 e207 bffc e44c 4000 a610 0012 8090 0013 0280 0039 0100 0000 d007 bffc d24a 0000 9410 0009 960a a0ff 1900 012c 9813 2030
0571260 9a10 2001 da2a c00c de07 bffc e04b e001 a210 0010 a40c 60ff 2700 012b a614 e330 a810 2001 e82c 8013 ea07 bffc ec4d 4000
0571340 ae10 0016 b00d e0ff 3300 012c b216 6130 f407 bffc f64e a001 f62e 0019 f807 bffc fa4f 2001 9010 001d 920a 20ff 1500 012c
0571420 9412 a230 d607 bffc d84a c000 d82a 400a da07 bffc de4b 4000 a010 000f a20c 20ff 2500 012c a414 a330 a610 2001 e62c 4012
0571500 e807 bffc ea4d 2001 ac10 0015 ac0d a0ff 3100 012c b016 2330 b210 2001 f22d c018 f407 bffc b406 a002 f427 bffc 10bf ffc5
0571560 0100 0000 c027 bff8 f607 bff8 80a6 e00a 1680 001b 0100 0000 d007 bff8 1300 011e 9212 6160 d44a 0009 9610 000a 980a e0ff
0571640 1b00 012d 9a13 6130 de07 bff8 de2b 000d e007 bff8 2300 011e a214 6160 e44c 0011 a610 0012 a80c e0ff 2b00 012d aa15 6030
0571720 ac10 2001 ec2d 0015 ee07 bff8 ae05 e001 ee27 bff8 10bf ffe5 0100 0000 b010 2001 3300 011e f026 616c 81c7 e008 81e8 0000
0572000 033f ffff 8200 63c0 9de3 8001 f02f a047 1100 011e d002 216c 8090 0008 1280 0004 0100 0000 7fff ff49 0100 0000 d24f a047
0572060 9410 0009 960a a0ff 1900 012d 9813 2130 d04a c00c 1080 0003 0100 0000 9010 2000 b010 0008 81c7 e008 81e8 0000 033f ffff
0572140 8200 63c0 9de3 8001 f02f a047 1100 011e d002 216c 8090 0008 1280 0004 0100 0000 7fff ff32 0100 0000 d24f a047 9410 0009
0572220 960a a0ff 1900 012c 9813 2130 d04a c00c 1080 0003 0100 0000 9010 2000 b010 0008 81c7 e008 81e8 0000 033f ffff 8200 63b8
0572300 9de3 8001 f027 a044 1100 011e d002 216c 8090 0008 1280 0004 0100 0000 7fff ff1b 0100 0000 d207 a044 d227 bffc d407 bffc
0572360 d64a 8000 9810 000b 8090 000c 0280 0010 0100 0000 da07 bffc de4b 4000 a010 000f a20c 20ff 2500 012c a414 a130 e64c 4012
0572440 e807 bffc e62d 0000 ea07 bffc aa05 6001 ea27 bffc 10bf ffee 0100 0000 81c7 e008 81e8 0000 033f ffff 8200 63c0 9de3 8001
0572520 f02f a047 1100 011e d002 216c 8090 0008 1280 0004 0100 0000 7fff fef8 0100 0000 d24f a047 9410 0009 960a a0ff 1900 012c
0572600 9813 2230 d04a c00c 1080 0003 0100 0000 9010 2000 b010 0008 81c7 e008 81e8 0000 033f ffff 8200 63b8 9de3 8001 f027 a044
0572660 1100 011e d002 216c 8090 0008 1280 0004 0100 0000 7fff fee1 0100 0000 d207 a044 d227 bffc d407 bffc d64a 8000 9810 000b
0572740 8090 000c 0280 0010 0100 0000 da07 bffc de4b 4000 a010 000f a20c 20ff 2500 012c a414 a230 e64c 4012 e807 bffc e62d 0000
0573020 ea07 bffc aa05 6001 ea27 bffc 10bf ffee 0100 0000 81c7 e008 81e8 0000 033f ffff 8200 6398 9de3 8001 f027 a044 f227 a048
0573100 7fff f36d 0100 0000 7fff f376 0100 0000 d007 a048 4000 2ab9 0100 0000 ba10 0008 d007 a044 4000 2ab5 0100 0000 9002 001d
0573160 9002 2001 7fff f4db 010c 0000 d027 bffc d027 bff8 d007 a044 9002 2001 d027 a044 9222 2001 d44a 4000 d607 bff8 d42a c000
0573240 9810 000a 8090 000c 0280 0007 0100 0000 da07 bff8 9a03 6001 da27 bff8 10bf fff2 0100 0000 de07 a048 9e03 e001 de27 a048
0573320 a023 e001 e24c 0000 e407 bff8 e22c 8000 a610 0011 8090 0013 0280 0007 0100 0000 e807 bff8 a805 2001 e827 bff8 10bf fff2
0573400 0100 0000 ea07 bffc ea27 bff8 d007 bff8 4000 011f 0100 0000 d027 bffc d007 bff8 7fff f4cb 0100 0000 7fff f35a 0100 0000
0573460 d007 bffc 1080 0003 0100 0000 9010 2000 b010 0008 81c7 e008 81e8 0000 033f ffff 8200 63c0 9de3 8001 1100 0007 9012 21e5
0573540 ba10 0008 8090 0018 1280 0005 0100 0000 1100 011e 9012 2180 b010 0008 d24e 0000 9410 0009 8090 000a 0280 000c 0100 0000
0573620 d04e 0000 9210 0008 ba1f 4009 b006 2001 972f 6008 ba1f 400b 993f 6005 ba1f 400c 10bf fff3 0100 0000 9b3f 601d ba1f 400d
0573700 9f2f 6017 ba1f 400f a13f 6013 ba1f 4010 a32f 6011 ba1f 4011 a53f 600d ba1f 4012 a72f 600b ba1f 4013 a93f 6007 ba1f 4014
0573760 ab2f 6005 ba1f 4015 ad3f 6003 ba1f 4016 af2f 6001 ba1f 4017 9010 001d 1080 0003 0100 0000 9010 2000 b010 0008 81c7 e008
0574040 81e8 0000 033f ffff 8200 63c0 9de3 8001 f02f a047 1100 011e d002 216c 8090 0008 1280 0004 0100 0000 7fff fe40 0100 0000
0574120 d24f a047 9410 0009 960a a0ff 1900 012b 9813 2330 d04a c00c 1080 0003 0100 0000 9010 2000 b010 0008 81c7 e008 81e8 0000
0574200 033f ffff 8200 63c0 9de3 8001 f02f a047 1100 011e d002 216c 8090 0008 1280 0004 0100 0000 7fff fe29 0100 0000 d24f a047
0574260 9410 0009 960a a0ff 1900 012c 9813 2030 d04a c00c 1080 0003 0100 0000 9010 2000 b010 0008 81c7 e008 81e8 0000 033f ffff
0574340 8200 63c0 9de3 8001 f02f a047 1100 011e d002 216c 8090 0008 1280 0004 0100 0000 7fff fe12 0100 0000 d24f a047 9410 0009
0574420 960a a0ff 1900 012d 9813 2230 d04a c00c 1080 0003 0100 0000 9010 2000 b010 0008 81c7 e008 81e8 0000 033f ffff 8200 63c0
0574500 9de3 8001 f02f a047 1100 011e d002 216c 8090 0008 1280 0004 0100 0000 7fff fdfb 0100 0000 d24f a047 9410 0009 960a a0ff
0574560 1900 012d 9813 2030 d04a c00c 1080 0003 0100 0000 9010 2000 b010 0008 81c7 e008 81e8 0000 033f ffff 8200 63c0 9de3 8001
0574640 f02f a047 1100 011e d002 216c 8090 0008 1280 0004 0100 0000 7fff fde4 0100 0000 d24f a047 9410 0009 960a a0ff 1900 012c
0574720 9813 2330 d04a c00c 1080 0003 0100 0000 9010 2000 b010 0008 81c7 e008 81e8 0000 033f ffff 8200 63c0 9de3 8001 f02f a047
0575000 1100 011e d002 216c 8090 0008 1280 0004 0100 0000 7fff fdcd 0100 0000 d24f a047 9410 0009 960a a0ff 1900 012d 9813 2030
0575060 da4a c00c 8090 000d 1280 000b 0100 0000 de4f a047 a010 000f a20c 20ff 2500 012c a414 a330 e64c 4012 8090 0013 0280 0005
0575140 0100 0000 9010 2001 1080 0003 0100 0000 9010 2000 1080 0003 0100 0000 9010 2000 b010 0008 81c7 e008 81e8 0000 033f ffff
0575220 8200 6398 9de3 8001 f027 a044 d007 a044 4000 29a6 0100 0000 9002 2001 d027 bff8 1300 011e d202 6170 d407 bff8 80a2 400a
0575300 1680 0014 0100 0000 d007 bff8 80a2 27d0 1680 0007 0100 0000 9010 27d0 1300 011e d022 6170 1080 0005 0100 0000 d007 bff8
0575360 1300 011e d022 6170 1100 011e d002 2170 7fff f3b8 0100 0000 1500 012d d022 a330 1700 012d d602 e330 d627 bffc 1130 011e
0575440 d002 2170 9022 2001 1300 011e d022 6170 1590 012d d402 a330 9402 a001 1700 012d d422 e330 9622 a001 da07 a044 9a03 6001
0575520 da27 a044 9e23 6001 e04b c000 e02b 0000 a210 0010 8090 0011 12bf ffed 0100 0000 d007 bffc 1080 0003 0100 0000 9010 2000
```

```
0575600 b010 0008 81c7 e008 81e8 0000 033f ffff 8200 63a0 9de3 8001 f027 a044 1100 011e 9012 2174 ba10 0008 1100 011e d002 2178
0575660 8090 0008 1280 000a 0100 0000 9010 2000 9210 2064 7fff f255 0100 0000 7fff f231 0100 0000 1300 011e d022 6178 d007 a044
0575740 7fff fedb 0100 0000 b810 0008 d407 4000 8090 000a 0280 0023 0100 0000 d007 4000 d202 2004 9427 0009 b610 000a 8090 000a
0576020 1280 000f 0100 0000 d607 4000 d202 c000 d007 a044 4000 00c6 0100 0000 b610 0008 8090 0008 1280 0006 0100 0000 d007 4000
0576100 d002 0000 1080 002a 0100 0000 8090 001b 0480 0007 0100 0000 d007 4000 9202 200c ba10 0009 1080 0005 0100 0000 d007 4000
0576160 9202 2008 ba10 c009 10bf ffdd 0100 0000 1100 011e d002 2179 7fff f1e6 0100 0000 9010 2010 7fff f353 0100 0000 d027 4000
0576240 d407 4000 d607 4000 c022 e00c 9810 2000 d822 a008 da07 4000 f823 6004 d007 a044 7fff ff73 0100 0000 de07 4000 d023 c000
0576320 7fff f1f0 0100 c000 e007 4000 d004 c000 1080 0003 0100 0000 9010 2000 b010 0008 81c7 e008 81e8 0000 033f ffff 8200 6398
0576400 9de3 8001 f027 a044 c027 bff8 c027 bffc d007 bff8 9002 2001 d027 bff8 d207 bffc 932a 6001 9410 0009 952a a002 9202 400a
0576460 d227 bffc d607 a044 d04a c000 7fff fdb1 0100 0000 d807 bffc 9803 0008 d827 bffc da07 a044 9a03 6001 da27 a044 de07 a044
0576540 d04b c000 7fff fef5 0100 0000 8090 0008 12bf ffe8 0100 0000 9027 a008 1080 0002 0100 0000 9210 2008 4000 2955 0100 0000
0576620 033f ffff 8200 6380 9de3 8001 f027 a044 f227 a048 d007 a044 d04a 0000 7fff fee3 0100 0000 8090 0008 0280 0009 0100 0000
0576700 d207 a048 d04a 4000 7fff fedc 0100 0000 9090 0008 1280 0022 0100 0000 d007 a048 d24a 0000 d407 a044 d64a 8000 80a2 c009
0576760 0280 000a 0100 0000 d807 a048 da4b 0000 9e10 000d e007 a044 d04c 0000 9022 000f 1080 0048 0100 0000 e207 a044 e44c 4000
0577040 a610 0012 8090 0013 1280 0005 0100 0000 9010 2000 1080 003f 0100 0000 e807 a044 a805 2001 e827 a044 ea07 a048 aa05 6001
0577120 ea27 a048 10bf ffd4 0100 0000 ac03 a060 ec23 a040 d007 a044 7fff ffa4 0100 0000 0000 0008 ae27 a008 f002 0000 f202 2004
0577200 f025 e000 f225 e004 b403 a060 f423 a040 d007 a048 7fff ff99 0100 0000 0000 0008 b627 a010 f802 0000 fa02 2004 f826 e000
0577260 fa26 e004 d007 bffc d207 bff4 9422 0009 d427 bfec 8090 000a 0280 0005 0100 0000 d007 bfec 1080 0017 0100 0000 d007 bff8
0577340 d207 bff0 9422 0009 d427 bfec 8090 000a 0280 0005 0100 0000 d007 bfec 1080 000d 0100 0000 d007 bff8 d207 a044 9202 4008
0577420 d227 a044 d407 bff0 d607 a048 9602 c00a d627 a048 10bf ffa0 0100 0000 9010 2000 b010 0008 81c7 e008 81e8 0000 033f ffff
0577500 8200 63a0 9de3 8001 f027 a044 f227 a048 d007 a044 d207 a048 4000 2872 0100 0000 1080 0003 0100 0000 9010 2000 b010 0008
0577560 81c7 e008 81e8 0000 033f ffff 8200 63c0 9de3 8001 f027 a044 f227 a048 1100 011e d002 216c 8090 0008 1280 0004 0100 0000
0577640 7fff fc6a 0100 0000 d207 a048 d44a 4000 9610 000a 980a e0ff 1b00 012c 9a13 6130 de4b 000d e007 a044 e24c 0000 a410 0011
0577720 a60c a0ff 2900 012c a815 2130 ea4c c014 90a5 400f 1280 0013 0100 0000 d007 a044 d24a 0000 9410 0009 8090 000a 1280 0005
0600000 0100 0000 9010 2000 1080 001d 0100 0000 d007 a044 9002 2001 d027 a044 d207 a048 9202 6001 d227 a048 10bf ffe0 0100 0000
0600060 d407 a048 d64a 8000 9810 000b 9a0b 20ff 1f00 012c 9e13 e130 e04b 400f a210 0010 e407 a044 e64c 8000 a810 0013 aa0d 20ff
0600140 2d00 012c ac15 a130 d04d 4016 9022 0011 1080 0003 0100 0000 9010 2000 b010 0008 81c7 e008 81e8 0000 9de3 bfa0 d206 2004
0600220 b32e 6018 d202 6014 b33e 6018 8090 0009 2280 0008 d606 2004 4000 27f7 9010 0018 8090 0008 0280 003c 0100 0000 d606 2004
0600300 d602 e008 d602 e010 de06 2004 de03 e008 de03 e00c 80a3 c00b 2a80 0011 d206 2004 c206 2004 920e 60ff c200 6008 c200 6024
0600360 c200 6014 ea06 2004 ea05 6008 ea05 6024 ea55 6010 d006 2004 d002 2008 9fc0 4000 9002 0015 1080 000b b210 0008 b32e 6018
0600440 d202 6008 b33e 6018 9202 600c d802 4000 9803 2001 d822 4000 f22b 3fff b20e 60ff 80a6 7fff 3280 0012 da06 2004 e606 2004
0600520 a604 e00c ea04 c000 aa15 6003 ea24 c000 ee06 2004 ae05 e010 f605 c000 b616 e003 f625 c000 d206 2004 9202 6010 d602 4000
0600600 9612 e003 d622 4000 da06 2004 da03 601c 8090 000d 0280 0004 0100 0000 4000 27bd 9010 0018 81c7 e008 81e8 0000 9de3 bfa0
0600660 1100 012d 4000 27cc 9012 2338 81c7 e008 91e8 2000 9de3 bfa0 1100 012d 9012 2338 4000 27c8 9210 2002 81c7 e008 91e8 2000
0600740 0003 c06c 0000 0896 ffff ffbc 0003 c078 0000 0496 ffff ffb4 0003 c084 0000 4396 ffff ffd8 0003 c090 0000 4296 ffff fed0
0601020 0003 c09c 0000 4896 ffff fe7c 0003 c0a8 0000 4996 ffff fe38 0003 c0b4 0000 4696 ffff fde8 0003 c0c0 0000 4a96 ffff fbf8
0601100 0003 c0cc 0000 5a96 ffff fbbc 0003 c0d8 0000 5c96 ffff f964 0003 c0e4 0000 4196 ffff f698 0003 c0f0 0000 4096 ffff f668
0601160 0000 2dac 0000 6f88 0000 0000 0000 2db0 0000 6f8b 0000 0000 0003 c0fc 0000 6a96 ffff fe80 0000 2e0c 0000 6f88 0000 0000
0601240 0000 2e10 0000 6f8b 0000 0000 0000 2e48 0000 6f88 0000 0000 0000 2e4c 0000 6f8b 0000 0000 0003 c108 0000 6396 ffff fde4
0601320 0000 2e84 0000 6f88 0000 0000 0000 2e88 0000 6f8b 0000 0000 0003 c114 0000 6296 ffff fd94 0000 2ec4 0000 6f88 0000 0000
0601400 0000 2ec8 0000 6f8b 0000 0000 0003 c120 0000 6e96 ffff fd1c 0000 30b8 0000 6f88 0000 0000 0000 30bc 0000 6f8b 0000 0000
0601460 0000 3554 0000 6f88 0000 0000 0000 3558 0000 6f8b 0000 0000 0000 35d0 0000 6f88 0000 0000 0000 35d4 0000 6f8b 0000 0000
0601540 0000 351c 0000 6f88 0000 0000 0000 3620 0000 6f8b 0000 0000 0003 c12c 0000 8296 ffff f8a0 0003 c138 0000 9496 ffff f6c8
0601620 0003 c144 0000 9196 ffff f5f4 0003 c150 0000 9596 ffff f028 0000 4534 0000 6f88 0000 0000 0000 4538 0000 6f8b 0000 0000
0601700 0000 4928 0000 6f88 0000 0000 0000 492c 0000 6f8b 0000 0000 0000 4968 0000 6f88 0000 0000 0000 496c 0000 6f8b 0000 0000
0601760 0000 498c 0000 6f88 0000 0000 0000 4990 0000 6f8b 0000 0000 0000 49d0 0000 6f88 0000 0000 0000 49d4 0000 6f8b 0000 0000
0602040 0000 4a04 0000 6f88 0000 0000 0000 4a08 0000 6f8b 0000 0000 0000 4b98 0000 6f88 0000 0000 0000 4b9c 0000 6f8b 0000 0000
0602120 0000 4ee0 0000 6f88 0000 0000 0000 4ee4 0000 6f8b 0000 0000 0000 4f44 0000 6f88 0000 0000 0000 4f48 0000 6f8b 0000 0000
0602200 0000 54b8 0000 6f88 0000 0000 0000 54bc 0000 6f8b 0000 0000 0000 5524 0000 6f88 0000 0000 0000 5528 0000 6f8b 0000 0000
0602260 0000 5550 0000 6f88 0000 0000 0000 5554 0000 6f8b 0000 0000 0000 557c 0000 6f88 0000 0000 0000 5580 0000 6f8b 0000 0000
0602340 0000 55a8 0000 6f88 0000 0000 0000 55ac 0000 6f8b 0000 0000 0000 55d4 0000 6f88 0000 0000 0000 55d8 0000 6f8b 0000 0000
0602420 0000 5600 0000 6f88 0000 0000 0000 5604 0000 6f8b 0000 0000 0003 c15c 0000 c596 ffff f014 0000 6abc 0000 6f88 0000 0000
0602500 0000 6ac0 0000 6f8b 0000 0000 0000 6b54 0000 6f88 0000 0000 0000 6b58 0000 6f8b 0000 0000 0000 7714 0000 6f88 0000 0000
0602560 0000 7718 0000 6f8b 0000 0000 0000 7760 0000 6f88 0000 0000 0000 7764 0000 6f8b 0000 0000 0000 77a8 0000 6f88 0000 0000
0602640 0000 77ac 0000 6f8b 0000 0000 0000 77c8 0000 6f88 0000 0000 0000 77cc 0000 6f8b 0000 0000 0000 77fc 0000 6f88 0000 0000
```

```
0602720  0000 7800 0000 6f8b 0000 0000 0000 7810 0000 6f88 0000 0000 0000 7814 0000 6f8b 0000 0000 0000 7834 0000 6f88 0000 0000
0603000  0000 7838 0000 6f8b 0000 0000 0000 7894 0000 6f88 0000 0000 0000 7898 0000 6f8b 0000 0000 0000 7cd4 0000 6f88 0000 0000
0603060  0000 7cd8 0000 6f8b 0000 0000 0000 7d20 0000 6f88 0000 0000 0000 7d24 0000 6f8b 0000 0000 0003 c168 0000 e896 ffff fc94
0603140  0003 c174 0000 e596 ffff fc48 0000 7fe8 0000 6f88 0000 0000 0000 7fec 0000 6f8b 0000 0000 0000 8484 0000 6f88 0000 0000
0603220  0000 8488 0000 6f8b 0000 0000 0000 8f90 0000 6f88 0000 0000 0000 8f94 0000 6f8b 0000 0000 0003 c180 0001 2896 ffff e5e0
0603300  0000 ae50 0000 6f88 0000 0000 0000 ae54 0000 6f8b 0000 0000 0000 aee8 0000 6f88 0000 0000 0000 aeec 0000 6f8b 0000 0000
0603360  0003 c18c 0001 2a96 ffff fb48 0000 b6bc 0000 6f88 0000 0000 0000 b6c0 0000 6f8b 0000 0000 0000 b84c 0000 6f88 0000 0000
0603440  0000 b850 0000 6f8b 0000 0000 0000 b8e4 0000 6f88 0000 0000 0000 b8e8 0000 6f8b 0000 0000 0000 c450 0000 6f88 0000 0000
0603520  0000 c454 0000 6f8b 0000 0000 0000 d208 0000 6f88 0000 0000 0000 d20c 0000 6f8b 0000 0000 0000 d968 0000 6f88 0000 0000
0603600  0000 d96c 0000 6f8b 0000 0000 0000 de0c 0000 6f88 0000 0000 0000 de10 0000 6f8b 0000 0000 0000 dfe8 0000 6f88 0000 0000
0603660  0000 dfec 0000 6f8b 0000 0000 0003 c198 0001 ae96 ffff fb48 0003 c1a4 0001 ad96 ffff f7a8 0003 c1b0 0001 7696 ffff e514
0603740  0003 c1bc 0001 7796 ffff d6c8 0003 c1c8 0001 a396 ffff cbb0 0003 c1d4 0001 c296 ffff c57c 0003 c1e0 0001 c396 ffff bef8
0604020  0003 c1ec 0001 af96 ffff be00 0003 c1f8 0001 6996 ffff bca8 0003 c204 0001 6796 ffff b6ac 0003 c210 0001 fd96 ffff ffec
0604100  0003 c21c 0001 e096 ffff d800 0003 c228 0001 d496 ffff d428 0003 c234 0002 1696 ffff ff00 0003 c240 0002 1296 ffff fe80
0604160  0003 c24c 0002 1496 ffff fe24 0003 c258 0002 1196 ffff fe14 0003 c264 0002 1596 ffff fdbc 0003 c270 0002 1396 ffff fcbc
0604240  0003 c27c 0002 1996 ffff fad4 0003 c288 0002 4996 ffff ff94 0003 c294 0002 5396 ffff 9a64 0003 c2a0 0002 5796 ffff 9848
0604320  0003 c2ac 0002 7196 ffff e778 0002 7a5c 0000 6f88 0000 0000 0002 7a60 0000 6f8b 0000 0000 0002 7af4 0000 6f88 0000 0000
0604400  0002 7af8 0000 6f8b 0000 0000 0002 86e8 0000 6f88 0000 0000 0002 86ec 0000 6f8b 0000 0000 0002 8780 0000 6f88 0000 0000
0604460  0002 8784 0000 6f8b 0000 0000 0002 9a84 0000 6f88 0000 0000 0002 9a88 0000 6f8b 0000 0000 0002 9b1c 0000 6f88 0000 0000
0604540  0002 9b20 0000 6f8b 0000 0000 0002 a340 0000 6f88 0000 0000 0002 a344 0000 6f8b 0000 0000 0002 a3d8 0000 6f88 0000 0000
0604620  0002 a3dc 0000 6f8b 0000 0000 0003 c2b8 0002 e696 0000 0000 0002 abec 0000 6f88 0000 0000 0002 abf0 0000 6f8b 0000 0000
0604700  0002 ac84 0000 6f88 0000 0000 0002 ac88 0000 6f8b 0000 0000 0002 b4a4 0000 6f88 0000 0000 0002 b4a8 0000 6f8b 0000 0000
0604760  0002 b53c 0000 6f88 0000 0000 0002 b540 0000 6f8b 0000 0000 0002 bc18 0000 6f88 0000 0000 0002 bc1c 0000 6f8b 0000 0000
0605040  0002 c160 0000 6f88 0000 0000 0002 c164 0000 6f8b 0000 0000 0002 ccd8 0000 6f88 0000 0000 0002 ccdc 0000 6f8b 0000 0000
0605120  0003 c2c4 0003 1a96 ffff fe44 0003 c2d0 0003 1996 ffff f9c4 0003 c2dc 0003 5596 ffff f3c0 0000 02ce 0000 02ed 0000 005c
0605200  0000 020b 0000 00ab 0000 010d 0000 007a 0000 011f 0000 0065 0000 00fd 0000 0110 0000 033b 0000 0046 0000 02df 0000 001a
0605260  0000 00da 0000 0377 0000 0120 0000 0035 0000 00e5 0000 0040 0000 00f4 0000 003a 0000 00ff 0000 0132 0000 0209 0000 004b
0605340  0000 01a2 0000 0066 0000 016f 0000 005e 0000 0128 0000 005f 0000 010c 0000 00c9 0000 032a 0000 00d4 0000 01b0 0000 003d
0605420  0000 0345 0000 0053 0000 0106 0000 0016 0000 00dc 0000 01db 0000 0274 0000 0019 0000 00de 0000 007e 0000 011b 0000 01bf
0605500  0000 0000 0000 003e 0000 0114 0000 0012 0000 0000 0000 028b 0000 02c1 0000 000c 0000 00d8 0000 005a 0000 01fe 0000 0346
0605560  0000 0000 0000 018d 0000 0277 0000 016b 0000 023a 0000 0081 0000 0166 0000 002b 0000 00ee 0000 00d3 0000 012f 0000 0038
0605640  0000 0177 0000 0072 0000 00f9 0000 0074 0000 01dd 0000 015f 0000 0195 0000 0027 0000 00e7 0000 00b7 0000 014a 0000 0187
0605720  0000 0000 0000 0118 0000 01a9 0000 0054 0000 0123 0000 0127 0000 026a 0000 0029 0000 0131 0000 00bd 0000 0118 0000 008f
0606000  0000 0000 0000 00aa 0000 010f ffff ffff 0000 0000 0000 011c 0000 016c 0000 0081 0000 010e 0000 00ed 0000 0204 0000 004c
0606060  0000 00f1 0000 00a5 0000 0159 0000 0135 0000 01f7 0000 007f 0000 030b 0000 0061 0000 01d4 0000 0047 0000 00eb 0000 007b
0606140  0000 0163 0000 00ad 0000 011c 0000 0063 0000 0000 0000 00bf 0000 012c 0000 0169 0000 0200 0000 0155 0000 0292 0000 0010
0606220  0000 00d9 0000 0059 0000 0132 0000 0023 0000 022c 0000 00c4 0000 0122 0000 033d 0000 0000 0000 00ff 0000 0239 0000 0093
0606300  0000 0216 0000 0342 0000 0154 0000 0030 0000 00ea 0000 0003 0000 0113 0000 0009 0000 00d7 0000 02a0 0000 0000 0000 0173
0606360  0000 0233 0000 00b6 0000 02f4 0000 0011 0000 00db 0000 0090 0000 012e 0000 021e 0000 0269 0000 00f5 0000 0146 0000 0211
0606440  0000 0000 0000 0092 0000 01b1 0000 009b 0000 01ef 0000 00d8 0000 013c 0000 0067 0000 0000 0000 003f 0000 0103 0000 0091
0606520  0000 01e5 0000 009f 0000 0116 0000 0025 0000 00e0 0000 01a4 0000 0000 0000 0344 0000 0000 0000 0078 0000 01f6 0000 0258
0606600  0000 0000 0000 01da 0000 02c3 0000 01d4 0000 025e 0000 0044 0000 00ec ffff ffff 0000 0000 0000 00e9 0000 0248 0000 0069
0606660  0000 0111 0000 0005 0000 00e9 0000 01c6 0000 027c 0000 00f7 0000 019c 0000 0333 0000 0000 0000 00ea 0000 01d9 0000 0159
0606740  0000 019e 0000 036f 0000 017d 0000 0051 0000 0214 0000 006d 0000 0193 0000 0266 0000 02ac 0000 0049 0000 0180 ffff ffff
0607020  0000 0000 0000 00f2 0000 0185 0000 001e 0000 00df 0000 00ef 0000 0238 0000 002f 0000 00f7 0000 007d 0000 02ae 0000 005d
0607100  0000 0196 0000 00c7 0000 0287 0000 017b 0000 01c8 0000 00d9 0000 0135 0000 001c 0000 0105 0000 00b5 0000 0115 0000 0015
0607160  0000 00e1 0000 0064 0000 0156 0000 0084 0000 0251 0000 0152 0000 02ea 0000 0103 0000 01e4 0000 0002 0000 02ca 0000 002e
0607240  0000 0148 0000 016c 0000 0235 0000 002a 0000 01f0 0000 00c3 0000 01ae 0000 000d 0000 00f3 0000 0000 0000 00d6 ffff ffff
0607320  0000 0000 0000 00e3 0000 0136 0000 002c 0000 019d 0000 0043 0000 0219 0000 02f8 0000 0000 0000 00bc 0000 0134 0000 0087
0607400  0000 01e3 0000 0088 0000 026f 0000 0191 0000 01ec 0000 004e 0000 0160 0000 0034 0000 00e6 0000 0098 0000 0117 0000 032e
0607460  0000 0000 0000 0165 0000 0198 0000 00c1 0000 0178 0000 0174 0000 026d 0000 0028 0000 0130 0000 014e 0000 01da 0000 000f
0607540  0000 01e1 0000 00be 0000 01c7 0000 003b 0000 00e4 0000 00f9 0000 0173 0000 004f 0000 014c 0000 0071 0000 0162 0000 0060
0607620  0000 0175 0000 0106 0000 02d5 0000 0039 0000 0129 0000 01ae 0000 0302 0000 000b 0000 00e2 0000 0050 0000 00f6 ffff ffff
0607700  0000 0000 0000 01bc 0000 022e 0000 006a 0000 0147 0000 0160 0000 01a7 0000 0007 0000 0188 0000 01fc 0000 025c 0000 0018
0607760  0000 00f5 0000 008e 0000 0110 0000 0036 0000 0170 0000 00e4 0000 014e 0000 00fc 0000 0278 0000 006b 0000 00fe 0000 0001
```

```
0610040  0000 014d 0000 0004 0000 0259 0000 0055 0000 022b 0000 0195 0000 0206 0000 014d 0000 01ac 0000 0079 0000 00f8 ffff ffff
0610120  0000 0000 0000 00a6 0000 011d 0000 0014 0000 016a 0000 009c 0000 024d 0000 0020 0000 00dd 0000 0057 0000 0127 0000 00ae
0610200  0000 027a 0000 0006 0000 00fb 0000 0033 0000 01a4 0000 0070 0000 0205 0000 0356 0000 0000 0000 00b1 0000 01a8 0000 01e3
0610260  0000 0000 0000 0002 0000 00f0 ffff ffff 0000 0000 0000 0114 0000 0168 0000 0351 0000 0000 0000 00dc 0000 0133 0000 0073
0610340  0000 0197 0000 00c0 0000 0184 0000 010c 0000 01bc 0000 0086 0000 0245 0000 031e 0000 0000 0000 015b 0000 01b9 0000 0031
0610420  0000 0190 0000 00ca 0000 012b 0000 000e 0000 0246 0000 0008 0000 0126 0000 000a 0000 00e8 0000 0013 0000 00ef 0000 0017
0610500  0000 01a1 0000 001b 0000 02e6 0000 001d 0000 011a 0000 001f 0000 0107 0000 0021 0000 00e3 0000 0022 0000 018c 0000 0024
0610560  0000 0150 0000 0026 0000 0000 0000 002d 0000 0000 0000 0032 0000 024b 0000 0037 0000 01e9 0000 003c 0000 0102 0000 0045
0610640  0000 01ab 0000 0048 0000 0263 0000 004a 0000 0149 0000 004d 0000 0030 0000 0052 0000 0217 0000 0056 0000 0112 0000 0058
0610720  0000 00ed 0000 005b 0000 0176 0000 0062 0000 0158 0000 0068 0000 00fc 0000 006c 0000 0100 0000 006e 0000 00f2 0000 0075
0611000  0000 0155 0000 0076 0000 00fa 0000 007c 0000 011e 0000 0080 0000 010a 0000 0082 0000 0119 0000 0083 0000 0187 0000 0085
0611060  0000 02bb 0000 0089 0000 0104 0000 008a 0000 0218 0000 008b 0000 012a 0000 008c 0000 0108 0000 008d 0000 028e 0000 0094
0611140  0000 0101 0000 0095 0000 0109 0000 0096 0000 017b 0000 0097 0000 0000 0000 0099 0000 0151 0000 009a 0000 01f3 0000 009d
0611220  0000 014b 0000 009e 0000 02c9 0000 00a0 0000 017a 0000 00a1 0000 01b3 0000 00a2 0000 01ee 0000 00a3 0000 0140 0000 00a4
0611300  0000 0182 0000 00a7 0000 010b 0000 00a8 0000 01e7 0000 00a9 0000 012d 0000 00ac 0000 0124 0000 00af 0000 018d 0000 00b0
0611360  0000 0137 0000 00b2 0000 0183 0000 00b3 0000 0141 0000 00b4 0000 024e 0000 00b8 0000 016e 0000 00b9 0000 01ce 0000 00ba
0611440  0000 013b 0000 00bb 0000 0169 0000 00c2 0000 0203 0000 00c5 0000 015a 0000 00c6 0000 01b7 0000 00c8 0000 0191 0000 00cb
0611520  0000 0165 0000 00cc 0000 0125 0000 00cd 0000 0265 0000 00ce 0000 0208 0000 00cf 0000 026c 0000 00d0 0000 0121 0000 00d1
0611600  0000 0139 0000 00d5 0000 0192 0000 00d6 0000 014f 0000 00d7 0000 013e 0000 00da 0000 015d 0000 00db 0000 0161 0000 00dd
0611660  0000 0142 0000 00de 0000 0000 0000 00df 0000 0215 0000 00e0 0000 0153 0000 00e1 0000 0144 0000 00e2 0000 0247 0000 00e5
0611740  0000 013f 0000 00e6 0000 013d 0000 00e7 0000 016b 0000 00e8 0000 0179 0000 00eb 0000 0194 0000 00ec 0000 0267 0000 00ee
0612020  0000 01d7 0000 00f0 0000 013a 0000 00f1 0000 0201 0000 00f3 0000 0138 0000 00f4 0000 0157 0000 00f6 0000 0143 0000 00f8
0612100  0000 01cb 0000 00fa 0000 0000 0000 00fb 0000 01f1 0000 00fd 0000 015e 0000 00fe 0000 01b2 0000 0100 0000 015c 0000 0101
0612160  0000 0181 0000 0102 0000 0230 0000 0104 0000 018e 0000 0105 0000 01b6 0000 0107 0000 0145 0000 0108 0000 031f 0000 0109
0612240  0000 01b4 0000 010a 0000 018b 0000 010b 0000 02a7 0000 010d 0000 01d2 0000 010e 0000 022d 0000 010f 0000 01e2 0000 0111
0612320  0000 0152 0000 0112 0000 0174 0000 0113 0000 02ff 0000 0115 0000 02b7 0000 0116 0000 0000 0000 0117 0000 01c5 0000 0119
0612400  0000 0171 0000 011a 0000 01a0 0000 011b 0000 016d 0000 011d 0000 020f 0000 011e 0000 01bd 0000 011f 0000 025a 0000 0120
0612460  0000 0167 0000 0121 0000 015f 0000 0122 0000 01cd 0000 0123 0000 015b 0000 0124 0000 017c 0000 0125 0000 021a 0000 0126
0612540  0000 01fd 0000 0128 0000 0000 0000 0129 0000 0186 0000 012a 0000 0164 0000 012b 0000 01af 0000 012c 0000 01c6 0000 012d
0612620  0000 01fb 0000 012e 0000 018f 0000 012f 0000 01b5 0000 0130 0000 0000 0000 0131 0000 0221 0000 0133 0000 01ba 0000 0134
0612700  0000 0189 0000 0136 0000 01b8 0000 0137 0000 0199 0000 0138 0000 0212 0000 0139 0000 0232 0000 013a 0000 017e 0000 013b
0612760  0000 01d3 0000 013c 0000 01c3 0000 013d 0000 0172 0000 013e 0000 0320 0000 013f 0000 0229 0000 0140 0000 017f 0000 0141
0613040  0000 019b 0000 0142 0000 01a5 0000 0143 0000 019a 0000 0144 0000 01a6 0000 0145 0000 0000 0000 0146 0000 0000 0000 0147
0613120  0000 01f2 0000 0148 0000 01df 0000 0149 0000 0000 0000 014a 0000 021d 0000 014b 0000 018a 0000 014c 0000 0241 0000 014f
0613200  0000 01c4 0000 0150 0000 0231 0000 0151 0000 01d6 0000 0153 0000 01fa 0000 0154 0000 01bb 0000 0156 0000 019f 0000 0157
0613260  0000 01e8 0000 0158 0000 01ca 0000 015a 0000 01aa 0000 015c 0000 0253 0000 015d 0000 01ad 0000 015e 0000 0311 0000 0161
0613340  0000 01f8 0000 0162 0000 01a3 0000 0163 0000 0312 0000 0164 0000 025d 0000 0166 0000 0000 0000 0167 0000 02a3 0000 0168
0613420  0000 0266 0000 016a 0000 0000 0000 016d 0000 01d0 0000 016e 0000 0000 0000 016f 0000 01c1 0000 0170 0000 0275 0000 0171
0613500  0000 01de 0000 0172 0000 01be 0000 0175 0000 027b 0000 0176 0000 01c2 0000 0177 0000 021b 0000 0178 0000 0000 0000 0179
0613560  0000 01ff 0000 017a 0000 02c8 0000 017c 0000 01c9 0000 017d 0000 0213 0000 017e 0000 0276 0000 017f 0000 0000 0000 0180
0613640  0000 024a 0000 0181 0000 01dc 0000 0182 0000 0224 0000 0183 0000 02cd 0000 0184 0000 0297 0000 0185 0000 01c0 0000 0186
0613720  0000 0000 0000 0188 0000 023c 0000 0189 0000 01d1 0000 018a 0000 01cc 0000 018b 0000 01d8 0000 018c 0000 02ee 0000 018e
0614000  0000 0000 0000 018f 0000 024f 0000 0190 0000 030d 0000 0192 0000 02fd 0000 0193 0000 01db 0000 0194 0000 0329 0000 0196
0614060  0000 0237 0000 0197 0000 0294 0000 0198 0000 028b 0000 0199 0000 0358 0000 019a 0000 01bf 0000 019b 0000 01eb 0000 019c
0614140  0000 0000 0000 019d 0000 023b 0000 019e 0000 0222 0000 019f 0000 0336 0000 01a0 0000 01e6 0000 01a1 0000 01cf 0000 01a2
0614220  0000 0355 0000 01a3 0000 020c 0000 01a5 0000 0283 0000 01a6 0000 0202 0000 01a7 0000 0000 0000 01a8 0000 01e0 0000 01a9
0614300  0000 0000 0000 01aa 0000 020a 0000 01ab 0000 01d5 0000 01ac 0000 0223 0000 01ad 0000 02b5 0000 01af 0000 032f 0000 01b0
0614360  0000 025b 0000 01b1 0000 0349 0000 01b2 0000 01ea 0000 01b3 0000 01ed 0000 01b4 0000 02dd 0000 01b5 0000 01f4 0000 01b6
0614440  0000 02b6 0000 01b7 0000 021c 0000 01b8 0000 02e4 0000 01b9 0000 027f 0000 01ba 0000 021f 0000 01bb 0000 02b8 0000 01bd
0614520  0000 027e 0000 01be 0000 0000 0000 01c0 0000 029a 0000 01c1 0000 0220 0000 01c2 0000 01f5 0000 01c3 0000 0227 0000 01c4
0614600  0000 0350 0000 01c5 0000 02ec 0000 01c7 0000 0280 0000 01c8 0000 0000 0000 01c9 0000 0256 0000 01ca 0000 0000 0000 01cb
0614660  0000 023d 0000 01cc 0000 0343 0000 01cd 0000 01fc 0000 01ce 0000 026b 0000 01cf 0000 0000 0000 01d0 0000 0279 0000 01d1
0614740  0000 0225 0000 01d2 0000 0000 0000 01d3 0000 0257 0000 01d5 0000 034e 0000 01d6 0000 01f9 0000 01d7 0000 0271 0000 01d8
0615020  0000 0000 0000 01d9 0000 0207 0000 01dc 0000 032b 0000 01dd 0000 02aa 0000 01de 0000 0342 0000 01df 0000 0282 0000 01e0
0615100  0000 0000 0000 01e1 0000 021e 0000 01e2 0000 0210 0000 01e4 0000 022a 0000 01e5 0000 0249 0000 01e6 0000 020e 0000 01e7
```

```
0615160  0000 0268 0000 01e8 0000 0000 0000 01e9 0000 020d 0000 01ea 0000 0236 0000 01eb 0000 0264 0000 01ec 0000 0211 0000 01ed
0615240  0000 02a9 0000 01ee 0000 02a0 0000 01ef 0000 0000 0000 01f0 0000 0000 0000 01f1 0000 029d 0000 01f2 0000 0000 0000 01f3
0615320  0000 0000 0000 01f4 0000 0299 0000 01f5 0000 0000 0000 01f6 0000 023f 0000 01f7 0000 0000 0000 01f8 0000 0243 0000 01f9
0615400  0000 02e1 0000 01fa 0000 0305 0000 01fb 0000 0000 0000 01fd 0000 0000 0000 01fe 0000 0244 0000 01ff 0000 0000 0000 0200
0615460  0000 0254 0000 0201 0000 02d0 0000 0202 0000 0234 0000 0203 0000 023e 0000 0204 0000 022f 0000 0205 0000 02cf 0000 0206
0615540  0000 033c 0000 0207 0000 0226 0000 0208 0000 030c 0000 0209 0000 0255 0000 020a 0000 0258 0000 020b 0000 026e 0000 020c
0615620  0000 029c 0000 020d 0000 0242 0000 020e 0000 0228 0000 020f 0000 02e2 0000 0210 0000 0332 0000 0212 0000 029b 0000 0213
0615700  0000 02c2 0000 0214 0000 0000 0000 0215 0000 0291 0000 0216 0000 0281 0000 0217 0000 0000 0000 0218 0000 028a 0000 0219
0615760  0000 0250 0000 021a 0000 02a8 0000 021b 0000 02da 0000 021c 0000 0000 0000 021d 0000 0000 0000 021f 0000 02b3 0000 0220
0616040  0000 0240 0000 0221 0000 02de 0000 0222 0000 0252 0000 0223 0000 0261 0000 0224 0000 027d 0000 0225 0000 0262 0000 0226
0616120  0000 0285 0000 0227 0000 0000 0000 0228 0000 0000 0000 0229 0000 02a4 0000 022a 0000 0260 0000 022b 0000 030f 0000 022c
0616200  0000 0288 0000 022d 0000 0328 0000 022e 0000 0000 0000 022f 0000 0351 0000 0230 0000 0334 0000 0231 0000 024c 0000 0232
0616260  0000 02be 0000 0233 0000 0308 0000 0234 0000 02d9 0000 0235 0000 02d7 0000 0236 0000 025f 0000 0237 0000 034d 0000 0238
0616340  0000 02cc 0000 0239 0000 0000 0000 023a 0000 02ad 0000 023b 0000 0338 0000 023c 0000 0000 0000 023d 0000 0000 0000 023e
0616420  0000 0000 0000 023f 0000 0289 0000 0240 0000 0284 0000 0241 0000 0000 0000 0242 0000 0000 0000 0243 0000 031a 0000 0244
0616500  0000 02d6 0000 0245 0000 02b9 0000 0246 0000 0000 0000 0247 0000 0298 0000 0248 0000 0000 0000 0249 0000 02d3 0000 024a
0616560  0000 0000 0000 024b 0000 02e7 0000 024c 0000 0272 0000 024d 0000 032c 0000 024e 0000 0273 0000 024f 0000 02a1 0000 0250
0616640  0000 02bd 0000 0251 0000 02b2 0000 0252 0000 02e3 0000 0253 0000 0270 0000 0254 0000 0000 0000 0255 0000 028d 0000 0256
0616720  0000 029f 0000 0257 0000 028c 0000 0259 0000 0323 0000 025a 0000 0295 0000 025b 0000 02e8 0000 025c 0000 0290 0000 025d
0617000  0000 028f 0000 025e 0000 0000 0000 025f 0000 0000 0000 0260 0000 0341 0000 0261 0000 02a2 0000 0262 0000 0286 0000 0263
0617060  0000 0296 0000 0264 0000 0000 0000 0265 0000 0000 0000 0267 0000 0000 0000 0268 0000 0354 0000 0269 0000 0000 0000 026a
0617140  0000 0000 0000 026b 0000 02ce 0000 026c 0000 029e 0000 026d 0000 0000 0000 026e 0000 0000 0000 026f 0000 0000 0000 0270
0617220  0000 034a 0000 0271 0000 02d4 0000 0272 0000 0000 0000 0273 0000 0000 0000 0274 0000 02a6 0000 0275 0000 0000 0000 0276
0617300  0000 0000 0000 0277 0000 0303 0000 0278 0000 02f9 0000 0279 0000 031b 0000 027a 0000 0315 0000 027b 0000 0000 0000 027c
0617360  0000 0293 0000 027d 0000 0000 0000 027e 0000 0000 0000 027f 0000 02b0 0000 0280 0000 0000 0000 0281 0000 0340 0000 0282
0617440  0000 02f6 0000 0283 0000 02af 0000 0284 0000 0000 0000 0285 0000 02d1 0000 0286 0000 0000 0000 0287 0000 034c 0000 0288
0617520  0000 0000 0000 0289 0000 02e9 0000 028a 0000 0000 0000 028c 0000 02bf 0000 028d 0000 02ab 0000 028e 0000 02cb 0000 028f
0617600  0000 02a5 0000 0290 0000 02c4 0000 0291 0000 0360 0000 0292 0000 02b4 0000 0293 0000 02c6 0000 0294 0000 0000 0000 0295
0617660  0000 0000 0000 0296 0000 0321 0000 0297 0000 0324 0000 0298 0000 02f8 0000 0299 0000 0000 0000 029a 0000 0000 0000 029b
0617740  0000 02c7 0000 029c 0000 02dc 0000 029d 0000 02c5 0000 029e 0000 02b1 0000 029f 0000 031e 0000 02a1 0000 02c0 0000 02a2
0620020  0000 02eb 0000 02a3 0000 0304 0000 02a4 0000 02f5 0000 02a5 0000 0301 0000 02a6 0000 02bc 0000 02a7 0000 0000 0000 02a8
0620100  0000 02ba 0000 02a9 0000 0000 0000 02aa 0000 0000 0000 02ab 0000 0000 0000 02ac 0000 0319 0000 02ad 0000 0000 0000 02ae
0620160  0000 0000 0000 02af 0000 02d8 0000 02b0 0000 0000 0000 02b1 0000 032e 0000 02b2 0000 0000 0000 02b3 0000 02fc 0000 02b4
0620240  0000 0313 0000 02b5 0000 0335 0000 02b6 0000 0000 0000 02b7 0000 02f1 0000 02b8 0000 0359 0000 02b9 0000 0000 0000 02ba
0620320  0000 0316 0000 02bb 0000 030e 0000 02bc 0000 0000 0000 02bd 0000 0322 0000 02be 0000 02f0 0000 02bf 0000 0000 0000 02c0
0620400  0000 02d2 0000 02c1 0000 0318 0000 02c2 0000 0000 0000 02c3 0000 0307 0000 02c4 0000 030a 0000 02c5 0000 02f3 0000 02c6
0620460  0000 0000 0000 02c7 0000 02db 0000 02c8 0000 0000 0000 02c9 0000 0339 0000 02ca 0000 0357 0000 02cb 0000 02f2 0000 02cc
0620540  0000 02e0 0000 02cd 0000 0309 0000 02cf 0000 02fb 0000 02d0 0000 0317 0000 02d1 0000 0000 0000 02d2 0000 0000 0000 02d3
0620620  0000 0000 0000 02d4 0000 02e5 0000 02d5 0000 0000 0000 02d6 0000 0331 0000 02d7 0000 0333 0000 02d8 0000 0000 0000 02d9
0620700  0000 0000 0000 02da 0000 031d 0000 02db 0000 02fa 0000 02dc 0000 0000 0000 02dd 0000 0348 0000 02de 0000 02ef 0000 02df
0620760  0000 0000 0000 02e0 0000 034b 0000 02e1 0000 0000 0000 02e2 0000 0000 0000 02e3 0000 02f7 0000 02e4 0000 0000 0000 02e5
0621040  0000 0000 0000 02e6 0000 0000 0000 02e7 0000 0000 0000 02e8 0000 0000 0000 02e9 0000 0000 0000 02ea 0000 0306 0000 02eb
0621120  0000 0000 0000 02ec 0000 0300 0000 02ed 0000 02fe 0000 02ee 0000 0353 0000 02ef 0000 0000 0000 02f0 0000 0000 0000 02f1
0621200  0000 0000 0000 02f2 0000 0000 0000 02f3 0000 031c 0000 02f4 0000 0000 0000 02f5 0000 0327 0000 02f6 0000 0000 0000 02f7
0621260  0000 0000 0000 02f9 0000 0000 0000 02fa 0000 0300 0000 02fb 0000 0000 0000 02fc 0000 0000 0000 02fd 0000 0337 0000 02fe
0621340  0000 0314 0000 02ff 0000 0330 0000 0300 0000 0310 0000 0301 0000 0000 0000 0302 0000 0000 0000 0303 0000 032d 0000 0304
0621420  0000 033d 0000 0305 0000 0000 0000 0306 0000 033f 0000 0307 0000 0344 0000 0308 0000 0000 0000 0309 0000 0000 0000 030a
0621500  0000 0000 0000 030b 0000 0000 0000 030c 0000 0356 0000 030d 0000 034f 0000 030e 0000 0000 0000 030f 0000 0000 0000 0310
0621560  0000 0000 0000 0311 0000 0325 0000 0312 0000 0000 0000 0313 0000 0000 0000 0314 0000 0000 0000 0315 0000 0000 0000 0316
0621640  0000 0326 0000 0317 0000 0000 0000 0318 0000 0000 0000 0319 0000 0000 0000 031a 0000 0000 0000 031b 0000 0000 0000 031c
0621720  0000 0000 0000 031d 0000 0000 0000 031f 0000 033e 0000 0320 0000 0000 0000 0321 0000 0000 0000 0322 0000 0000 0000 0323
0622000  0000 0000 0000 0324 0000 035b 0000 0325 0000 0000 0000 0326 0000 0346 0000 0327 0000 0000 0000 0328 0000 0000 0000 0329
0622060  0000 0000 0000 032a 0000 033a 0000 032b 0000 0000 0000 032c 0000 0000 0000 032d 0000 0347 0000 032f 0000 0000 0000 0330
0622140  0000 0000 0000 0331 0000 0000 0000 0332 0000 0352 0000 0334 0000 0000 0000 0335 0000 035d 0000 0336 0000 035a 0000 0337
0622220  0000 0000 0000 0338 0000 0000 0000 0339 0000 0000 0000 033a 0000 0000 0000 033b 0000 0000 0000 033c 0000 035f 0000 033e
```

| | | | | | | | | | | | | | | | | | | | | | | | | |
|---|---|---|---|---|---|---|---|---|---|---|---|---|---|---|---|---|---|---|---|---|---|---|---|---|
| 0622300 | 0000 | 0000 | 0000 | 033f | 0000 | 035c | 0000 | 0340 | 0000 | 0000 | 0000 | 0341 | 0000 | 0000 | 0000 | 0342 | 0000 | 0000 | 0000 | 0343 | 0000 | 0000 | 0000 | 0345 |
| 0622360 | 0000 | 0000 | 0000 | 0347 | 0000 | 035e | 0000 | 0348 | 0000 | 0000 | 0000 | 0349 | 0000 | 0000 | 0000 | 034a | 0000 | 0000 | 0000 | 034b | 0000 | 0000 | 0000 | 034c |
| 0622440 | 0000 | 0000 | 0000 | 034d | 0000 | 0000 | 0000 | 034e | 0000 | 0000 | 0000 | 034f | 0000 | 0000 | 0000 | 0350 | 0000 | 0000 | 0000 | 0352 | 0000 | 0000 | 0000 | 0353 |
| 0622520 | 0000 | 0000 | 0000 | 0354 | 0000 | 0000 | 0000 | 0355 | 0000 | 0000 | 0000 | 0357 | 0000 | 0000 | 0000 | 0358 | 0000 | 0000 | 0000 | 0359 | 0000 | 0000 | 0000 | 0000 |
| 0622600 | 0500 | 078c | 0003 | b1a4 | 0000 | 0007 | 0700 | 06e1 | 0004 | 7d20 | 0000 | 000e | 0900 | 05cc | 0004 | b740 | 0000 | 0013 | 0500 | 050e | 0000 | 2020 | 0000 | 0019 |
| 0622660 | 0100 | 06e2 | 0000 | 0000 | 0000 | 0020 | 0500 | 037e | 0000 | b564 | 0000 | 0026 | 0700 | 0572 | 0003 | c2e8 | 0000 | 002f | 0700 | 0739 | 0003 | c000 | 0000 | 0039 |
| 0622740 | 0100 | 03a0 | 0000 | 0000 | 0000 | 003f | 0500 | 0727 | 0002 | cc98 | 0000 | 006a | 0500 | 0728 | 0002 | cc6c | 0000 | 0095 | 0500 | 0653 | 0000 | 76d4 | 0000 | 00ae |
| 0623020 | 0500 | 0775 | 0000 | 2c08 | 0000 | 00c7 | 0500 | 07b7 | 0000 | 76a8 | 0000 | 00e0 | 0500 | 003b | 0000 | 2bdc | 0000 | 00f9 | 0500 | 06c1 | 0000 | 4b58 | 0000 | 011d |
| 0623100 | 0500 | 0273 | 0000 | 4b2c | 0000 | 0141 | 0500 | 0729 | 0000 | c2d0 | 0000 | 015e | 0500 | 06d5 | 0000 | d928 | 0000 | 017b | 0500 | 038f | 0000 | c2a4 | 0000 | 0198 |
| 0623160 | 0500 | 033b | 0000 | d8fc | 0000 | 01b5 | 0500 | 0131 | 0000 | dee8 | 0000 | 01cf | 0500 | 07cb | 0002 | 8604 | 0000 | 01e9 | 0500 | 03f9 | 0000 | debc | 0000 | 0203 |
| 0623240 | 0500 | 01f5 | 0002 | 85d8 | 0000 | 021d | 0700 | 057d | 0003 | c358 | 0000 | 0225 | 0700 | 056d | 0003 | c2f0 | 0000 | 022d | 0500 | 0243 | 0002 | 99a0 | 0000 | 024b |
| 0623320 | 0500 | 0073 | 0002 | a25c | 0000 | 0269 | 0500 | 039f | 0000 | 3078 | 0000 | 0287 | 0500 | 03ad | 0002 | 9974 | 0000 | 02a5 | 0500 | 01dd | 0002 | a230 | 0000 | 02c3 |
| 0623400 | 0500 | 0509 | 0000 | 334c | 0000 | 02e1 | 0500 | 0371 | 0000 | 4ea0 | 0000 | 02f8 | 0500 | 0819 | 0000 | 4e74 | 0000 | 030f | 0500 | 0049 | 0002 | ab08 | 0000 | 0331 |
| 0623460 | 0500 | 05ad | 0002 | aadc | 0000 | 0353 | 0500 | 05a7 | 0002 | ba74 | 0000 | 0380 | 0500 | 05a8 | 0002 | ba48 | 0000 | 03ad | 0500 | 04a5 | 0002 | b3c0 | 0000 | 03c8 |
| 0623540 | 0500 | 006b | 0002 | c088 | 0000 | 03e3 | 0500 | 037f | 0000 | 44c0 | 0000 | 03fe | 0500 | 0197 | 0002 | b394 | 0000 | 0419 | 0500 | 05fb | 0002 | c048 | 0000 | 0434 |
| 0623620 | 0500 | 0071 | 0000 | 4494 | 0000 | 044f | 0500 | 0755 | 0000 | 8f10 | 0000 | 046e | 0500 | 018b | 0000 | 8ee4 | 0000 | 048d | 0500 | 0035 | 0003 | 21c4 | 0000 | 04a5 |
| 0623700 | 0500 | 00d3 | 0000 | 6a7c | 0000 | 04bd | 0500 | 00e7 | 0003 | 21ac | 0000 | 04d5 | 0500 | 0185 | 0000 | 6a3c | 0000 | 04ed | 0500 | 0827 | 0000 | add0 | 0000 | 0510 |
| 0623760 | 0500 | 027d | 0000 | c6e4 | 0000 | 0533 | 0500 | 01af | 0000 | ada4 | 0000 | 0556 | 0500 | 04a3 | 0000 | c6b8 | 0000 | 0579 | 0500 | 05d1 | 0002 | 7978 | 0000 | 0595 |
| 0624040 | 0500 | 00fb | 0000 | 7f68 | 0000 | 05b1 | 0500 | 0853 | 0002 | 794c | 0000 | 05cd | 0500 | 037d | 0000 | 7f3c | 0000 | 05e9 | 0500 | 0331 | 0000 | b7cc | 0000 | 0610 |
| 0624120 | 0500 | 0332 | 0000 | b738 | 0000 | 0637 | 0900 | 03db | 0004 | 7120 | 0000 | 0647 | 0500 | 03d4 | 0000 | bac0 | 0000 | 064f | 0500 | 0362 | 0000 | 2674 | 0000 | 066e |
| 0624200 | 0100 | 0780 | 0000 | 0000 | 0000 | 0687 | 0100 | 04aa | 0000 | 0000 | 0000 | 06a0 | 0100 | 02f2 | 0000 | 0000 | 0000 | 06b5 | 0100 | 0096 | 0000 | 0000 | 0000 | 06ca |
| 0624260 | 0700 | 0446 | 0004 | 7988 | 0000 | 06de | 0500 | 00c1 | 0000 | 2838 | 0000 | 0701 | 0100 | 0046 | 0000 | 0000 | 0000 | 070a | 0900 | 0776 | 0004 | 7d24 | 0000 | 0726 |
| 0624340 | 0100 | 06cb | 0000 | 0000 | 0000 | 0731 | 0100 | 0774 | 0000 | 0000 | 0000 | 0738 | 0100 | 072b | 0000 | 0000 | 0000 | 073f | 0500 | 0095 | 0000 | 26ec | 0000 | 075f |
| 0624420 | 0700 | 05f9 | 0004 | 7990 | 0000 | 0771 | 0500 | 044f | 0000 | 28c8 | 0000 | 0797 | 0900 | 0556 | 0004 | 7d28 | 0000 | 07b3 | 0700 | 06bf | 0004 | 798c | 0000 | 07c6 |
| 0624500 | 0500 | 025e | 0000 | 2610 | 0000 | 07df | 0500 | 0315 | 0000 | 23ec | 0000 | 07f6 | 0700 | 0412 | 0003 | c3c0 | 0000 | 07fd | 0900 | 0324 | 0004 | 7d30 | 0000 | 0808 |
| 0624560 | 0900 | 059b | 0004 | 7f30 | 0000 | 081a | 0900 | 0745 | 0004 | 7f34 | 0000 | 0829 | 0500 | 0221 | 0000 | b62c | 0000 | 0834 | 0500 | 07d2 | 0000 | bcd8 | 0000 | 083c |
| 0624640 | 0700 | 0866 | 0003 | c3c4 | 0000 | 0844 | 0700 | 086e | 0003 | c3c8 | 0000 | 084c | 0100 | 05a4 | 0000 | 0000 | 0000 | 0855 | 0500 | 084c | 0000 | bd70 | 0000 | 085d |
| 0624720 | 0100 | 0021 | 0000 | 0000 | 0000 | 0865 | 0500 | 005f | 0000 | 2880 | 0000 | 0887 | 0900 | 07db | 0004 | 7f38 | 0000 | 0893 | 0900 | 07dc | 0004 | 8138 | 0000 | 089f |
| 0625000 | 0700 | 05e7 | 0004 | 7994 | 0000 | 08b0 | 0500 | 086b | 0000 | 2efc | 0000 | 08d2 | 0100 | 04f6 | 0000 | 0000 | 0000 | 08e4 | 0100 | 04f9 | 0000 | 0000 | 0000 | 08f6 |
| 0625060 | 0700 | 007c | 0003 | c58c | 0000 | 0917 | 0700 | 04ca | 0003 | c56c | 0000 | 0938 | 0700 | 040a | 0003 | c568 | 0000 | 0959 | 0700 | 0801 | 0003 | c510 | 0000 | 096c |
| 0625140 | 0700 | 07f7 | 0003 | d714 | 0000 | 097d | 0500 | 015f | 0000 | 2d9c | 0000 | 0994 | 0100 | 032d | 0000 | 0000 | 0000 | 09a8 | 0700 | 0554 | 0003 | c590 | 0000 | 09c7 |
| 0625220 | 0500 | 0301 | 0000 | 2fe0 | 0000 | 09db | 0700 | 044c | 0003 | dab0 | 0000 | 09ec | 0100 | 0012 | 0000 | 0000 | 0000 | 09f4 | 0100 | 0384 | 0000 | 0000 | 0000 | 09fa |
| 0625300 | 0700 | 015a | 0003 | c6f8 | 0000 | 0a1a | 0700 | 0834 | 0003 | c6c8 | 0000 | 0a3a | 0700 | 05be | 0003 | c6c0 | 0000 | 0a5a | 0500 | 0247 | 0000 | 3db8 | 0000 | 0a88 |
| 0625360 | 0500 | 0695 | 0000 | 39dc | 0000 | 0aaf | 0500 | 07e9 | 0000 | 3afc | 0000 | 0acf | 0500 | 04e2 | 0001 | 142c | 0000 | 0ad9 | 0700 | 0740 | 0003 | dba0 | 0000 | 0ae8 |
| 0625440 | 0700 | 0762 | 0003 | c65c | 0000 | 0aef | 0900 | 03d0 | 0004 | 8338 | 0000 | 0af5 | 0500 | 019d | 0000 | 3678 | 0000 | 0b18 | 0500 | 0863 | 0000 | c0e4 | 0000 | 0b2b |
| 0625520 | 0700 | 0072 | 0003 | d734 | 0000 | 0b3f | 0700 | 0450 | 0003 | c6d0 | 0000 | 0b5d | 0700 | 0044 | 0003 | c6f4 | 0000 | 0b7f | 0700 | 0047 | 0003 | c6d4 | 0000 | 0ba1 |
| 0625600 | 0700 | 0760 | 0003 | c6c4 | 0000 | 0bc3 | 0700 | 07b3 | 0003 | cacc | 0000 | 0bd3 | 0100 | 05b3 | 0000 | 0000 | 0000 | 0bd8 | 0700 | 05a5 | 0003 | db28 | 0000 | 0be8 |
| 0625660 | 0500 | 07b1 | 0000 | 3748 | 0000 | 0c13 | 0500 | 011f | 0000 | 40d8 | 0000 | 0c4a | 0900 | 07d3 | 0004 | 8388 | 0000 | 0c51 | 0700 | 0595 | 0003 | c620 | 0000 | 0c56 |
| 0625740 | 0700 | 0596 | 0003 | c624 | 0000 | 0c5b | 0700 | 0006 | 0003 | c660 | 0000 | 0c6f | 0700 | 0258 | 0003 | c628 | 0000 | 0c7b | 0700 | 042a | 0003 | c6bc | 0000 | 0c9a |
| 0626020 | 0700 | 0382 | 0003 | c6cc | 0000 | 0cb9 | 0500 | 0222 | 0000 | 42c8 | 0000 | 0ced | 0500 | 0358 | 0000 | 3f88 | 0000 | 0d0f | 0500 | 00ad | 0002 | be78 | 0000 | 0d2a |
| 0626100 | 0700 | 0318 | 0003 | c6b8 | 0000 | 0d4d | 0100 | 0372 | 0000 | 0000 | 0000 | 0d53 | 0700 | 0432 | 0004 | 26ac | 0000 | 0d64 | 0700 | 0854 | 0003 | c8c8 | 0000 | 0d75 |
| 0626160 | 0100 | 0024 | 0000 | 0000 | 0000 | 0d7d | 0100 | 089c | 0000 | 0000 | 0000 | 0d85 | 0500 | 03e7 | 0000 | 3c2c | 0000 | 0daa | 0700 | 05ef | 0003 | d724 | 0000 | 0db9 |
| 0626240 | 0500 | 049c | 0000 | 3fe8 | 0000 | 0dd8 | 0500 | 0026 | 0000 | 314c | 0000 | 0df7 | 0500 | 0205 | 0000 | 3544 | 0000 | 0e0f | 0500 | 051d | 0000 | 4918 | 0000 | 0e24 |
| 0626320 | 0700 | 02ec | 0003 | c950 | 0000 | 0e41 | 0700 | 05a0 | 0003 | c920 | 0000 | 0e5e | 0500 | 0478 | 0000 | 4ac0 | 0000 | 0e77 | 0500 | 0786 | 0000 | 4a54 | 0000 | 0e90 |
| 0626400 | 0700 | 04f7 | 0003 | d6f8 | 0000 | 0ea2 | 0700 | 0686 | 0003 | c928 | 0000 | 0ebd | 0500 | 059d | 0000 | 4874 | 0000 | 0eda | 0700 | 0606 | 0003 | c94c | 0000 | 0ef9 |
| 0626460 | 0700 | 00a4 | 0003 | c92c | 0000 | 0f18 | 0700 | 0781 | 0003 | c924 | 0000 | 0f34 | 0700 | 02de | 0003 | cab4 | 0000 | 0f54 | 0700 | 009c | 0003 | ca88 | 0000 | 0f7f |
| 0626540 | 0700 | 009d | 0003 | ca30 | 0000 | 0faa | 0700 | 01c8 | 0003 | cab0 | 0000 | 0fcc | 0700 | 01ca | 0003 | ca90 | 0000 | 0fee | 0700 | 004a | 0003 | ca8c | 0000 | 1010 |
| 0626620 | 0500 | 0330 | 0000 | 56e8 | 0000 | 1028 | 0500 | 0068 | 0000 | 56ac | 0000 | 1040 | 0700 | 078f | 0003 | d704 | 0000 | 1051 | 0500 | 02db | 0000 | 53d4 | 0000 | 106c |
| 0626700 | 0500 | 0430 | 0000 | 637c | 0000 | 1086 | 0500 | 03d6 | 0000 | 60a8 | 0000 | 10a0 | 0500 | 02e2 | 0000 | 5900 | 0000 | 10ba | 0500 | 085f | 0000 | 5628 | 0000 | 10ce |
| 0626760 | 0500 | 015d | 0000 | d054 | 0000 | 10e3 | 0500 | 0426 | 0000 | 5e60 | 0000 | 1103 | 0700 | 0032 | 0003 | cb98 | 0000 | 111d | 0500 | 054a | 0000 | 5b08 | 0000 | 1138 |
| 0627040 | 0500 | 07be | 0000 | bc1c | 0000 | 1142 | 0700 | 088e | 0003 | cbbc | 0000 | 1160 | 0700 | 018e | 0003 | cb9c | 0000 | 117e | 0700 | 07ec | 0003 | cb8c | 0000 | 119c |
| 0627120 | 0700 | 02d0 | 0003 | c3c8 | 0000 | 11a2 | 0700 | 023e | 0003 | d754 | 0000 | 11aa | 0700 | 072e | 0003 | cb24 | 0000 | 11c5 | 0700 | 04fc | 0003 | cb94 | 0000 | 11e0 |
| 0627200 | 0500 | 01e6 | 0000 | 5e14 | 0000 | 11fa | 0500 | 03c1 | 0000 | 5d78 | 0000 | 1218 | 0500 | 0862 | 0000 | 61dc | 0000 | 1234 | 0700 | 001e | 0003 | cb88 | 0000 | 1253 |
| 0627260 | 0500 | 02c6 | 0000 | 5724 | 0000 | 126a | 0100 | 0818 | 0000 | 0000 | 0000 | 1272 | 0500 | 0711 | 0002 | c98c | 0000 | 128d | 0500 | 0016 | 0000 | 5f94 | 0000 | 12a8 |
| 0627340 | 0500 | 0283 | 0000 | d1e8 | 0000 | 12bc | 0500 | 01bf | 0000 | 54a8 | 0000 | 12d0 | 0500 | 0680 | 0000 | 65d8 | 0000 | 12e9 | 0700 | 02b2 | 0003 | cbc0 | 0000 | 1305 |

```
0627420 0700 0182 0003 cb90 0000 1321 0700 040c 0003 cb28 0000 133d 0500 089b 0000 5dc8 0000 135c 0700 0507 0003 d020 0000 1361
0627500 0700 042c 0003 cb84 0000 1388 0700 042d 0003 cb2c 0000 13af 0700 03fc 0003 d0b4 0000 13cf 0700 01d2 0003 d094 0000 13ef
0627560 0700 071a 0003 d080 0000 140c 0700 06f0 0003 d08c 0000 1429 0500 069d 0000 6fe4 0000 1446 0700 0574 0003 d024 0000 145c
0627640 0500 0292 0000 735c 0000 147c 0700 0666 0003 d0b8 0000 149a 0700 01a6 0003 d088 0000 14b8 0700 0334 0003 d084 0000 14d6
0627720 0500 0648 0000 72e0 0000 14f4 0500 00a0 0000 7264 0000 1512 0500 0605 0000 c1f4 0000 1528 0500 042e 0000 71b4 0000 1546
0630000 0700 0694 0003 d07c 0000 1569 0700 04fd 0003 d090 0000 1585 0700 03ea 0003 d2a0 0000 15a2 0700 018a 0003 d270 0000 15bf
0630060 0700 069e 0003 d26c 0000 15dc 0100 02ee 0000 0000 0000 15e7 0700 0033 0003 d208 0000 15fa 0500 07e2 0000 7de0 0000 1617
0630140 0100 0601 0000 0000 0000 161f 0700 0850 0003 d264 0000 1641 0700 0784 0003 d278 0000 165c 0500 07d7 0000 7cc4 0000 1673
0630220 0700 0704 0003 d29c 0000 1692 0700 01a2 0003 d27c 0300 16b1 0700 0022 0003 d260 0000 16d0 0700 0444 0003 d268 0000 16ec
0630300 0700 087e 0003 d274 0000 1708 0500 06e8 0000 81a4 0000 1729 0500 0234 0000 89f4 0000 1744 0500 07fc 0000 84f4 0000 175f
0630360 0700 0076 0003 d39c 0000 177f 0700 019c 0003 d3cc 0000 179f 0700 0600 0003 d398 0000 17bf 0700 0250 0003 d390 0000 17e4
0630440 0700 0492 0003 d3a4 0000 1802 0700 0088 0003 d3a8 0000 1824 0700 05c8 0003 d38c 0000 1846 0700 0087 0003 d3c8 0000 1868
0630520 0700 04e3 0003 d330 0000 187c 0700 046c 0003 d394 0000 189b 0700 03c4 0003 d3a0 0000 18ba 0500 045c 0000 8e64 0000 18d8
0630600 0700 05b4 0003 d388 0000 18fb 0500 02e6 0000 c8ac 0000 1916 0500 0314 0000 d778 0000 1929 0500 04ad 0000 d2c4 0000 193f
0630660 0500 0675 0000 8474 0000 1957 0500 0646 0002 1dc4 0000 1960 0700 06d6 0003 d560 0000 1980 0700 07de 0003 d564 0000 19a4
0630740 0700 030c 0003 d4e4 0000 19c8 0700 07df 0003 d584 0000 19ec 0700 01d6 0003 d554 0000 1a10 0700 03c2 0003 d4d8 0000 1a16
0631020 0500 008b 0000 aa60 0000 1a2a 0500 008d 0000 ad5c 0000 1a3a 0700 00ff 0003 d4cc 0000 1a3d 0700 0100 0003 d4c4 0000 1a40
0631100 0500 0659 0000 9790 0000 1a62 0500 0474 0002 1824 0000 1a6c 0500 030f 0002 3954 0000 1a76 0500 04cf 0002 1750 0000 1a80
0631160 0700 063a 0003 d4ec 0000 1aa1 0700 039a 0003 d55c 0000 1ac2 0700 0103 0003 d4c8 0000 1ac5 0500 081b 0000 ac30 0000 1ad6
0631240 0700 0418 0003 d4dc 0000 1adc 0700 02b8 0003 d4e0 0000 1b01 0700 01ee 0003 d550 0000 1b26 0500 083a 0000 bb60 0000 1b30
0631320 0700 010a 0003 d4c0 0000 1b33 0500 0662 0002 e3a8 0000 1b45 0500 0795 0002 1120 0000 1b50 0700 051e 0003 d558 0000 1b72
0631400 0700 0390 0003 d588 0000 1b94 0700 03e4 0003 d4f0 0000 1bb6 0700 010e 0003 d4d0 0000 1bb9 0700 032a 0003 d4f4 0000 1be6
0631460 0700 032b 0003 d54c 0000 1c13 0500 0714 0002 3000 0000 1c1b 0700 0114 0003 d4d4 0000 1c1e 0500 0030 0002 29ec 0000 1c2a
0631540 0100 036e 0000 0000 0000 1c30 0700 0668 0003 d4e8 0000 1c57 0100 06c0 0000 0000 0000 1c5e 0700 06c6 0003 d764 0000 1c82
0631620 0700 0396 0003 d7dc 0000 1c9f 0900 0249 0004 8398 0000 1cad 0700 0192 0003 d800 0000 1cce 0700 05e0 0003 d7e0 0000 1cef
0631700 0700 0520 0003 d7d0 0000 1d10 0700 0882 0003 d760 0000 1d31 0500 0328 0000 db64 0000 1d40 0700 07d6 0003 d768 0000 1d5e
0631760 0700 077e 0003 d7d8 0000 1d7c 0500 02c1 0002 b87c 0000 1da3 0700 02e1 0003 d744 0000 1db4 0700 02fa 0003 d7cc 0000 1dd6
0632040 0700 0877 0003 d75c 0000 1df8 0700 066a 0003 d804 0000 1e17 0700 0588 0003 d7d4 0000 1e36 0700 089d 0003 d76c 0000 1e55
0632120 0700 025d 0003 d758 0000 1e59 0700 00fa 0003 d7c8 0000 1e83 0700 00fe 0003 d770 0000 1ead 0900 016c 0004 8798 0000 1eba
0632200 0700 06cd 0003 d8e8 0000 1ec1 0700 03b9 0003 d8e4 0000 1ec7 0500 0898 0002 13fc 0000 1ed2 0700 07fd 0003 d8e0 0000 1ed9
0632260 0700 02c7 0004 7998 0000 1ee2 0500 0873 0000 bf10 0000 1ee9 0500 0771 0002 3b44 0000 1ef5 0700 0321 0003 d8ec 0000 1efb
0632340 0700 046a 0003 da84 0000 1f1c 0700 0692 0003 da28 0000 1f3e 0700 0690 0003 da80 0000 1f60 0500 0707 0000 c634 0000 1f7b
0632420 0700 0899 0003 dad0 0000 1f9b 0500 075d 0000 c680 0000 1fb0 0500 044a 0000 d10c 0000 1fc8 0500 0300 0000 c8f0 0000 1fe0
0632500 0500 008c 0000 ca80 0000 1ffb 0500 03f2 0000 cf64 0000 2017 0700 060e 0003 db64 0000 2034 0700 0858 0003 db68 0000 2055
0632560 0700 040b 0003 db88 0000 2076 0500 0681 0000 dc38 0000 208f 0700 0158 0003 db60 0000 20ad 0700 0045 0003 db8c 0000 20cc
0632640 0500 0845 0000 ce04 0000 20ee 0500 0274 0000 cc44 0000 2101 0700 0248 0003 dbfc 0000 2121 0700 001f 0003 dbdc 0000 2141
0632720 0500 05ff 0000 dca8 0000 215a 0700 04b2 0003 dc00 0000 2178 0500 0347 0000 ddec 0000 218b 0500 07a6 0000 dcf4 0000 21aa
0633000 0700 0348 0003 dbd8 0000 21c6 0700 0767 0003 debc 0000 21cf 0900 05ed 0004 8898 0000 21d8 0500 07c6 0000 e130 0000 21e1
0633060 0500 0805 0000 ee98 0000 21ea 0500 06f4 0001 1158 0000 21f3 0900 0839 0004 889c 0000 21fb 0100 035e 0000 0000 0000 2207
0633140 0700 0208 0003 deb0 0000 2211 0100 046f 0000 0000 0000 2216 0500 068b 0001 0098 0000 221f 0500 067d 0001 02b8 0000 2228
0633220 0900 07b8 0004 89a0 0000 2231 0500 0830 0001 2368 0000 223a 0500 0881 0001 0e98 0000 2243 0700 057e 0003 de58 0000 224c
0633300 0500 0370 0001 13cc 0000 2259 0500 0010 0001 846c 0000 2263 0700 0011 0003 e5dc 0000 226d 0500 0393 0001 0a10 0000 2277
0633360 0700 03b9 0003 de5c 0000 227d 0900 07d5 0004 8f08 0000 2286 0100 00aa 0000 0000 0000 228f 0100 00cd 0000 0000 0000 2298
0633440 0500 03b1 0001 3b08 0000 22a2 0500 0380 0001 4184 0000 22ac 0500 054b 0001 29fc 0000 22b6 0500 00bb 0001 3fa8 0000 22bf
0633520 0500 0083 0001 0cac 0000 22c8 0900 0815 0004 8f0c 0000 22d1 0900 00a7 0004 8f10 0000 22da 0900 07f5 0004 8f14 0000 22e3
0633600 0500 07fe 0003 f324 0000 22f0 0500 06c5 0001 9498 0000 22f7 0700 06c4 0004 1b40 0000 230f 0500 0106 0002 c370 0000 2318
0633660 0500 0142 0000 fc2c 0000 2321 0500 0172 0000 f91c 0000 232a 0500 06a5 0000 e438 0000 2334 0900 06c7 0004 8f18 0000 233e
0633740 0700 0327 0003 de78 0000 2348 0500 06f1 0000 f3c8 0000 2352 0500 0578 0001 21a0 0000 235c 0500 057a 0001 16a4 0000 2366
0634020 0700 0356 0003 de70 0000 2370 0500 0792 0000 f2bc 0000 237a 0700 039b 0003 de6c 0000 2384 0700 02c0 0004 1b3c 0000 238e
0634100 0500 0504 0001 29c0 0000 2398 0500 0583 0001 0878 0000 23a2 0500 05aa 0001 2c30 0000 23ad 0500 0860 0001 42d8 0000 23b7
0634160 0500 07c2 0000 e4a8 0000 23be 0500 04be 0001 2538 0000 23c9 0700 024b 0003 de74 0000 23d3 0500 0241 0001 0bc8 0000 23de
0634240 0500 07d4 0001 c25c 0000 23e5 0700 03e0 0003 de60 0000 23eb 0500 0027 0000 e5b0 0000 23f5 0900 014f 0004 8f1c 0000 23ff
0634320 0500 059e 0001 9848 0000 2407 0900 0661 0004 8f20 0000 240f 0500 002e 0002 cdb4 0000 2419 0500 035f 0002 d414 0000 2423
0634400 0900 0709 0004 8f24 0000 242b 0500 042f 0001 3010 0000 2436 0500 073a 0000 ed04 0000 2441 0100 064c 0000 0000 0000 2449
0634460 0500 069a 0001 44f4 0000 2451 0500 06b1 0002 6640 0000 2459 0500 03aa 0001 4c3c 0000 2465 0500 010b 0001 00f4 0000 2470
```

```
0634540 0700 0857 0003 e7c8 0000 2477 0700 081c 0003 de68 0000 247e 0900 06e9 0004 8f28 0000 2486 0500 071b 0000 e080 0000 248e
0634620 0700 06c8 0003 de54 0000 2496 0100 0266 0000 0000 0000 249f 0100 01fe 0000 0000 0000 24a8 0100 0448 0000 0000 0000 24ad
0634700 0700 024c 0004 1b38 0000 24bc 0500 029a 0001 2268 0000 24cb 0500 0419 0001 248c 0000 24d6 0500 06c2 0001 cb2c 0000 24de
0634760 0500 0744 0000 e580 0000 24ea 0900 033f 0004 8f2c 0000 24f3 0500 088f 0000 eafc 0000 24fe 0500 0003 0000 e6cc 0000 2506
0635040 0500 0524 0000 f170 0000 2511 0500 0872 0000 ff80 0000 2519 0500 0855 0000 fee8 0000 2521 0500 0884 0000 fb94 0000 2529
0635120 0700 0363 0003 de4c 0000 2536 0700 032e 0004 7aa0 0000 253c 0500 0549 0002 5280 0000 2545 0500 072c 0002 6710 0000 254d
0635200 0500 04d7 0002 65c0 0000 2556 0500 0604 0001 0bec 0000 2562 0100 0821 0000 0000 0000 256a 0100 009b 0000 0000 0000 2572
0635260 0500 054d 0000 e0e0 0000 257b 0500 0770 0001 6d44 0000 2587 0500 0383 0000 e3c4 0000 258d 0500 0367 0001 22d0 0000 2599
0635340 0700 0399 0003 de64 0000 259f 0900 078d 0004 8f30 0000 25a8 0700 018f 0004 09c0 0000 25b2 0500 07aa 0001 2fa0 0000 25bd
0635420 0500 06ee 0001 3ad0 0000 25c8 0500 0229 0001 2d5c 0000 25d7 0700 0505 0004 09c4 0000 25e0 0500 0655 0001 9440 0000 25e9
0635500 0500 0302 0001 3bb0 0000 25f3 0500 06ca 0001 93c0 0000 25fb 0500 0731 0001 3d88 0000 2606 0500 0508 0001 fdb0 0000 260f
0635560 0100 0379 0000 0000 0000 2615 0500 060d 0001 72cc 0000 261e 0500 00be 0001 598c 0000 2627 0500 07bf 0001 8420 0000 2631
0635640 0500 077d 0001 82f0 0000 263b 0500 0388 0002 50b4 0000 2645 0500 004e 0001 4594 0000 264f 0500 07ca 0001 8388 0000 2659
0635720 0500 001c 0001 4a9c 0000 2663 0500 0814 0001 5878 0000 266d 0500 07ed 0001 5710 0000 2677 0500 0025 0001 8984 0000 2681
0636000 0100 00bf 0000 0000 0000 268a 0500 042b 0001 621c 0000 2697 0500 073f 0001 9594 0000 269e 0500 025f 0001 833c 0000 26a8
0636060 0500 0257 0001 6c60 0000 26b2 0500 02ac 0001 83d4 0000 26bc 0500 028c 0001 4c7c 0000 26c6 0500 0014 0001 90ac 0000 26d1
0636140 0500 02af 0001 7028 0000 26db 0500 056c 0001 7520 0000 26e5 0500 0552 0001 8b34 0000 26fb 0500 006e 0001 64f4 0000 2706
0636220 0500 000e 0001 5504 0000 2711 0500 0761 0001 8fa8 0000 271b 0500 061e 0001 80b4 0000 2723 0500 0813 0001 ee18 0000 272a
0636300 0500 078b 0001 eac4 0000 2731 0500 07e4 0001 dcd4 0000 2738 0500 07af 0001 fcb4 0000 273f 0500 0219 0001 7c00 0000 274a
0636360 0500 076e 0001 6984 0000 2755 0500 062e 0001 4e14 0000 2760 0500 008a 0001 60a8 0000 276b 0500 00b6 0001 5d34 0000 2776
0636440 0500 06bb 0001 3810 0000 277e 0500 0885 0001 6818 0000 278a 0500 040e 0001 8248 0000 2793 0500 03e8 0001 7f20 0000 279c
0636520 0500 01f0 0001 7b70 0000 27a7 0100 06ab 0000 0000 0000 27af 0500 06e5 0001 e630 0000 27b7 0500 075b 0001 94f0 0000 27bf
0636600 0500 077a 0001 719c 0000 27c7 0500 02d2 0001 7660 0000 27d2 0500 019e 0001 7aa0 0000 27dd 0500 03dc 0001 58e0 0000 27e6
0636660 0500 0437 0001 8910 0000 27ed 0500 0560 0002 5140 0000 27f6 0500 0427 0001 453c 0000 27ff 0500 03d2 0001 5798 0000 2808
0636740 0500 051c 0001 5a90 0000 2811 0500 03fe 0001 5698 0000 281a 0500 081a 0001 8ca0 0000 2822 0500 057b 0001 7894 0000 282e
0637020 0500 06a8 0001 6440 0000 283b 0500 0184 0001 5b94 0000 2847 0500 015e 0001 5ea0 0000 2853 0500 0806 0001 52a0 0000 2860
0637100 0500 06d7 0001 978c 0000 2869 0100 0757 0000 0000 0000 2870 0100 0787 0000 0000 0000 2877 0100 07a2 0000 0000 0000 287e
0637160 0100 03d5 0000 0000 0000 2884 0100 0743 0000 0000 0000 288f 0100 081d 0000 0000 0000 2896 0500 04d9 0001 9344 0000 289f
0637240 0500 0630 0001 92d0 0000 28a8 0100 0875 0000 0000 0000 28b0 0500 065e 0001 a190 0000 28bd 0500 067a 0001 a0fc 0000 28c7
0637320 0500 05b8 0001 a1dc 0000 28d1 0500 04c3 0001 9ca0 0000 28de 0500 0431 0002 ea4c 0000 28e7 0500 007a 0001 9d7c 0000 28f1
0637400 0500 083b 0001 a064 0000 28fb 0500 0856 0001 9f40 0000 2905 0500 0189 0001 a420 0000 2912 0500 02fc 0001 a360 0000 291f
0637460 0500 0254 0003 0e04 0000 2934 0500 008e 0001 a0dc 0000 2942 0500 04eb 0001 a228 0000 294f 0500 086d 0002 e9e0 0000 2959
0637540 0500 04fa 0001 a2cc 0000 2963 0500 041c 0001 a488 0000 296d 0500 0438 0001 a3a4 0000 2977 0500 021a 0002 e490 0000 2985
0637620 0500 0667 0001 9dc4 0000 2990 0500 059c 0001 a26c 0000 299a 0500 039d 0001 a4ec 0000 29a8 0500 0242 0003 0350 0000 29b7
0637700 0500 0779 0003 0558 0000 29c6 0500 01c3 0001 a2a0 0000 29d4 0500 06c9 0001 a30c 0000 29df 0500 0338 0003 0abc 0000 29f2
0637760 0500 0019 0003 07a0 0000 2a05 0500 0420 0002 e420 0000 2a14 0500 0359 0001 9b64 0000 2a23 0500 07f8 0001 9b40 0000 2a32
0640040 0500 012a 0001 a144 0000 2a3d 0500 0061 0003 0404 0000 2a54 0500 04a2 0003 067c 0000 2a64 0500 06a1 0001 9bc0 0000 2a71
0640120 0500 0461 0001 9a6c 0000 2a7e 0500 0062 0001 9a38 0000 2a8b 0500 0001 0001 9fdc 0000 2a98 0500 0174 0001 9edc 0000 2aa5
0640200 0700 05ab 0003 f384 0000 2aae 0500 078e 0001 eb98 0000 2ab7 0500 050b 0001 e79c 0000 2ac0 0500 0764 0001 f8a0 0000 2ac9
0640260 0500 024e 0001 f994 0000 2ad3 0500 02ef 0001 d56c 0000 2add 0500 055a 0002 72f4 0000 2ae7 0700 0246 0003 f388 0000 2af1
0640340 0500 062d 0001 ff10 0000 2afe 0100 0765 0000 0000 0000 2b05 0500 023f 0001 fe34 0000 2b0f 0500 028d 0002 01c8 0000 2b19
0640420 0900 004f 0004 9264 0000 2b24 0500 07f9 0001 fba8 0000 2b2b 0500 0797 0001 f9fc 0000 2b32 0500 0798 0001 f28c 0000 2b39
0640500 0500 07c7 0001 f068 0000 2b40 0900 054c 0004 9268 0000 2b4b 0700 044b 0003 f38c 0000 2b56 0100 0678 0000 0000 0000 2b5e
0640560 0500 093c 0001 f7cc 0000 2b66 0500 0576 0001 f620 0000 2b72 0700 050d 0004 09d8 0000 2b7b 0100 04b3 0000 0000 0000 2b84
0640640 0500 020f 0002 0074 0000 2b94 0900 085a 0004 926c 0000 2ba1 0500 05fa 0002 2a6c 0000 2baa 0500 0618 0002 2db8 0000 2bb3
0640720 0500 05c2 0002 2960 0000 2bbc 0500 086c 0002 1668 0000 2bc9 0500 03ba 0002 28c8 0000 2bd3 0500 04af 0002 15ec 0000 2bdd
0641000 0500 020c 0002 3a40 0000 2beb 0900 002f 0004 9270 0000 2bf6 0500 01a9 0002 1b74 0000 2c01 0500 0090 0002 1580 0000 2c0c
0641060 0500 087d 0002 16dc 0000 2c18 0500 06b2 0002 1c70 0000 2c24 0500 03a7 0002 1510 0000 2c34 0500 032f 0002 5040 0000 2c3e
0641140 0700 0165 0004 09e8 0000 2c48 0700 0201 0004 09c8 0000 2c52 0700 01e0 0004 09dc 0000 2c5c 0700 01b0 0004 09ec 0000 2c66
0641220 0700 014c 0004 09e4 0000 2c70 0500 03a3 0002 51cc 0000 2c7e 0700 0521 0004 09f8 0000 2c89 0700 0511 0004 09f4 0000 2c94
0641300 0700 047b 0004 09bc 0000 2c9f 0100 0660 0000 0000 0000 2ca7 0700 04d5 0004 09e0 0000 2cb0 0700 0517 0004 09d0 0000 2cb9
0641360 0700 052a 0004 09d4 0000 2cc2 0700 0522 0004 09cc 0000 2ccb 0700 001a 0004 09f0 0000 2cd8 0500 02f4 0002 db08 0000 2ce9
0641440 0500 033a 0002 6548 0000 2cfa 0500 0119 0002 6694 0000 2d03 0700 005c 0004 32a0 0000 2d15 0500 027e 0002 e938 0000 2d20
0641520 0500 0265 0002 ed04 0000 2d2b 0500 0214 0002 dcdc 0000 2d3e 0500 03df 0002 e770 0000 2d4d 0500 044d 0002 f054 0000 2d67
0641600 0500 0004 0002 678c 0000 2d79 0700 0373 0004 329c 0000 2d89 0500 0738 0002 e518 0000 2d99 0500 0752 0002 67b0 0000 2da2
```

```
0641660 0500 003e 0002 69b8 0000 2dae 0500 009a 0002 6d60 0000 2db8 0500 0812 0002 6c1c 0000 2dc6 0500 04db 0002 6c58 0000 2dd2
0641740 0500 019b 0002 78dc 0000 2df8 0500 06da 0002 77a0 0000 2e1a 0500 01cb 0002 768c 0000 2e2e 0700 049e 0004 1c84 0000 2e4f
0642020 0700 0439 0004 1cfc 0000 2e69 0700 03f6 0004 1d20 0000 2e87 0700 0594 0004 1d00 0000 2ea5 0700 0354 0004 1cf0 0000 2ec3
0642100 0700 04d4 0004 1c80 0000 2ee1 0700 0542 0004 1c40 0000 2ef1 0700 0296 0004 1c88 0000 2f0c 0700 008f 0004 1c78 0000 2f27
0642160 0700 0064 0004 1cf8 0000 2f42 0500 0167 0002 bce0 0000 2f5f 0700 0424 0004 1cec 0000 2f7e 0700 02ad 0004 1c7c 0000 2f9d
0642240 0500 01f8 0002 b980 0000 2fbf 0500 079a 0002 bc0c 0000 2fd3 0700 0783 0004 26a8 0000 2fdb 0700 06b8 0004 1d24 0000 2ff7
0642320 0700 0589 0004 1cf4 0000 3013 0700 0816 0004 1c8c 0000 302f 0700 0832 0004 1ce8 0000 3056 0700 0833 0004 1c90 0000 307d
0642400 0700 07ce 0004 1da0 0000 308b 0700 0462 0004 1de8 0000 30a4 0700 01ae 0004 1e58 0000 30bd 0700 06ea 0004 1e4c 0000 30da
0642460 0700 068c 0004 1ddc 0000 30f7 0700 0342 0004 1e84 0000 3111 0700 02f6 0004 1e54 0000 312b 0700 05c0 0004 1dec 0000 3145
0642540 0700 017a 0004 1e48 0000 316a 0700 017b 0004 1df0 0000 318f 0500 0233 0002 84dc 0000 31b3 0700 0684 0004 1dd8 0000 31ca
0642620 0500 0546 0002 7fb8 0000 31ea 0500 0150 0002 7f84 0000 31fc 0700 04e6 0004 1de4 0000 321b 0700 05f9 0004 1e5c 0000 3233
0642700 0700 0069 0004 1e80 0000 324f 0700 0746 0004 1e60 0000 326b 0700 06b6 0004 1e50 0000 3287 0700 0716 0004 1de0 0000 32a3
0642760 0700 00e4 0004 2068 0000 32c3 0700 0758 0004 2048 0000 32e3 0700 06fa 0004 2038 0000 3303 0700 045d 0004 1fc8 0000 3323
0643040 0700 00ab 0004 1f88 0000 3335 0700 0402 0004 1fd0 0000 3352 0700 03d8 0004 2040 0000 336f 0700 0198 0004 2034 0000 3390
0643120 0700 0456 0004 1fc4 0000 33b1 0700 034e 0004 206c 0000 33cf 0700 072d 0004 203c 0000 33ed 0700 0018 0004 1fd4 0000 340b
0643200 0700 0098 0004 2030 0000 3434 0700 0099 0004 1fd8 0000 345d 0500 0019 0002 9504 0000 3485 0500 0223 0002 8de0 0000 34a9
0643260 0700 0514 0004 1fc0 0000 34c8 0500 0038 0002 8c0c 0000 34de 0700 037c 0004 1fcc 0000 3501 0700 01e4 0004 2044 0000 351d
0643340 0700 067b 0004 2328 0000 353d 0700 0451 0004 2308 0000 355d 0700 03f3 0004 22f8 0000 357d 0700 0154 0004 2288 0000 359d
0643420 0700 0700 0004 2248 0000 35af 0700 0113 0004 2290 0000 35cc 0700 00d0 0004 2300 0000 35e9 0700 072f 0004 22f4 0000 360a
0643500 0700 014e 0004 2284 0000 362b 0700 0056 0004 232c 0000 3649 0700 0425 0004 22fc 0000 3667 0700 05ae 0004 2294 0000 3685
0643560 0700 062f 0004 22f0 0000 36ae 0700 0632 0004 2298 0000 36d7 0500 07f3 0002 a18c 0000 36ff 0500 0654 0002 9fe0 0000 3723
0643640 0700 0124 0004 2280 0000 3742 0500 0824 0002 9fac 0000 3758 0700 0074 0004 228c 0000 377b 0700 077b 0004 2304 0000 3797
0643720 0700 0343 0004 2454 0000 37b7 0500 0320 0002 a948 0000 37e0 0700 044e 0004 2478 0000 3804 0700 0453 0004 2458 0000 3828
0644000 0700 06e0 0004 2448 0000 384c 0700 0817 0004 2318 0000 3870 0500 01c0 0002 a864 0000 388b 0700 0573 0004 23d0 0000 38b3
0644060 0700 02a6 0004 23e0 0000 38d4 0700 0007 0004 2450 0000 38f5 0100 0777 0000 0000 0000 38fc 0700 06f8 0004 2444 0000 3921
0644140 0700 07c3 0004 23d4 0000 3946 0700 0410 0004 2398 0000 395d 0700 089a 0004 247c 0000 397f 0700 0193 0004 244c 0000 39a1
0644220 0700 0050 0004 23e4 0000 39c3 0700 0835 0004 2440 0000 39f0 0700 083d 0004 23e8 0000 3a1d 0500 0535 0002 aa60 0000 3a4a
0644300 0700 02d4 0004 23dc 0000 3a71 0700 0209 0004 253c 0000 3a91 0700 005d 0004 2530 0000 3aaa 0700 0624 0004 25b4 0000 3ac3
0644360 0700 01b2 0004 25d8 0000 3ae0 0700 06d0 0004 25b8 0000 3afd 0700 05b0 0004 25a8 0000 3b1a 0700 0670 0004 2538 0000 3b37
0644440 0700 06f2 0004 24f8 0000 3b46 0700 0104 0004 2540 0000 3b60 0700 043a 0004 25b0 0000 3b7a 0700 0619 0004 25a4 0000 3b98
0644520 0700 055c 0004 2534 0000 3bb6 0700 0763 0004 25dc 0000 3bd1 0700 06ce 0004 25ac 0000 3bec 0700 03c0 0004 2544 0000 3c07
0644600 0700 03d3 0004 25a0 0000 3c2d 0700 03e2 0004 2548 0000 3c53 0500 01e3 0002 b31c 0000 3c78 0500 0580 0002 b14c 0000 3c99
0644660 0500 016a 0002 b114 0000 3cac 0500 030d 0002 b9e4 0000 3cce 0700 036c 0004 26e4 0000 3ceb 0700 05cd 0004 2714 0000 3d08
0644740 0700 00c8 0004 26ec 0000 3d23 0700 0385 0004 26f0 0000 3d42 0700 0048 0004 2710 0000 3d61 0700 01c2 0004 26e8 0000 3d7d
0645020 0500 0217 0002 bf24 0000 3d9c 0700 039e 0004 27c4 0000 3dbc 0700 06fc 0004 27cc 0000 3ddc 0700 02a4 0004 27f8 0000 3dfd
0645100 0700 07ba 0004 27c8 0000 3e1e 0700 06a9 0004 27c0 0000 3e3c 0700 082e 0004 27bc 0000 3e5e 0700 00ee 0004 27b8 0000 3e80
0645160 0700 0080 0004 27b0 0000 3e9f 0700 0894 0004 27d0 0000 3ebe 0700 007d 0004 27f4 0000 3ee1 0700 0085 0004 27d4 0000 3f04
0645240 0700 010f 0004 27b4 0000 3f2b 0100 06d8 0000 0000 0000 3f32 0100 000a 0000 0000 0000 3f3a 0500 0561 0002 ddec 0000 3f4b
0645320 0500 068d 0002 e030 0000 3f64 0500 028f 0003 10f0 0000 3f6e 0500 030e 0002 dc94 0000 3f81 0500 00fc 0002 dbf0 0000 3f91
0645400 0500 0013 0002 dab0 0000 3fa5 0500 0304 0002 dd50 0000 3fb9 0500 0183 0002 de38 0000 3fcc 0500 058d 0003 1124 0000 3fd5
0645460 0500 001d 0002 f748 0000 3ffb 0500 0475 0002 e22c 0000 400f 0500 07a8 0002 f36c 0000 4023 0500 0020 0002 f288 0000 4037
0645540 0500 017e 0002 f1c8 0000 404b 0500 05a6 0002 eec0 0000 4058 0500 01a3 0002 f3bc 0000 4070 0500 0712 0002 e328 0000 4088
0645620 0500 01b9 0002 ead8 0000 4099 0700 071d 0004 3298 0000 40aa 0700 0846 0004 3290 0000 40bb 0500 01fc 0002 ec8c 0000 40cc
0645700 0500 05de 0002 ef30 0000 40dd 0500 0457 0002 f200 0000 40ee 0500 0859 0002 e3f4 0000 4100 0500 0043 0002 fd44 0000 410b
0645760 0500 05c7 0002 f3d8 0000 412c 0500 07f0 0002 e268 0000 413b 0500 0676 0002 f144 0000 4143 0500 0389 0002 f0bc 0000 4156
0646040 0500 0376 0002 ffe0 0000 4169 0500 00a2 0002 f7f4 0000 4175 0500 0081 0002 e180 0000 4181 0500 085b 0002 f39c 0000 4198
0646120 0500 00d8 0002 ecc8 0000 41a8 0700 055f 0004 3294 0000 41b8 0500 04fe 0002 e2d0 0000 41c8 0500 0123 0002 f610 0000 41d3
0646200 0500 036a 0002 f694 0000 41e6 0500 0259 0002 f420 0000 41f2 0500 0665 0003 1078 0000 41ff 0500 00da 0003 0f7c 0000 4210
0646260 0500 034f 0003 174c 0000 4220 0500 0794 0003 0f04 0000 422e 0500 024a 0003 1b8c 0000 4246 0500 0133 0003 0450 0000 425c
0646340 0500 0245 0003 04a0 0000 426b 0500 06b0 0003 0830 0000 427f 0500 03dd 0003 1400 0000 429a 0500 0669 0003 19f0 0000 42ae
0646420 0500 069f 0003 1994 0000 42bb 0500 079d 0003 18dc 0000 42c8 0500 080a 0003 1880 0000 42d5 0500 079e 0003 1824 0000 42e2
0646500 0500 06ac 0003 1938 0000 42ef 0500 081e 0003 1d90 0000 4300 0500 00d4 0003 15a0 0000 4315 0500 0879 0003 14b8 0000 432a
0646560 0500 061a 0003 162c 0000 433c 0100 04e8 0000 0000 0000 4344 0500 0753 0003 1f78 0000 435e 0500 0127 0003 1f3c 0000 4371
0646640 0500 0598 0003 1544 0000 4384 0500 0793 0003 145c 5f65 7465 7874 005f 6564 6174 6100 5f65 6e64 0073 7461 7274 005f 5f65
0646720 7869 7400 5f6d 6169 6e00 5f65 6e76 6972 6f6e 005f 5f44 594e 414d 4943 005f 6578 6974 005f 5f5f 7374 645f 5f4d 475f 4d61
```

```
0647000 6e61 6765 725f 6378 785f 6765 745f 4d6f 6447 656e 5f43 6f6d 7050 7472 5f00 5f5f 5f73 7469 5f5f 4d47 5f4d 616e 6167 6572
0647060 5f63 7878 5f67 6574 5f4d 6f64 4765 6e5f 436f 6d70 5074 725f 005f 5f5f 7374 645f 5f44 6573 556e 6974 5f63 7878 5f49 4f4d
0647140 5f00 5f5f 5f73 7464 5f5f 494f 4d61 6e5f 6378 785f 494f 4175 785f 005f 5f5f 7374 695f 5f44 6573 556e 6974 5f63 7878 5f49
0647220 4f4d 5f00 5f5f 5f73 7469 5f5f 494f 4d61 6e5f 6378 785f 494f 4175 785f 005f 5f5f 7374 645f 5f65 6e74 6974 795f 6378 785f
0647300 7365 745f 656e 7469 7479 5f74 7970 655f 005f 5f5f 7374 695f 5f65 6e74 6974 795f 6378 785f 7365 745f 656e 7469 7479 5f74
0647360 7970 655f 005f 5f5f 7374 645f 5f4e 4f62 6a65 6374 5f64 625f 6378 785f 5f5f 6374 5f00 5f5f 5f73 7464 5f5f 504c 6973 745f
0647440 6462 5f63 7878 5f69 6e73 6572 745f 005f 5f5f 7374 695f 5f4e 4f62 6a65 6374 5f64 625f 6378 785f 5f5f 6374 5f00 5f5f 5f73
0647520 7469 5f5f 504c 6973 745f 6462 5f63 7878 5f69 6e73 6572 745f 005f 5f5f 7374 645f 5f4c 6973 745f 6462 5f63 7878 5f5f 5f64
0647600 745f 005f 5f5f 7374 645f 5f43 7578 5f63 7879 5f73 6574 496e 6465 785f 005f 5f5f 7374 695f 5f4c 6973 745f 6462 5f63 7878
0647660 5f5f 5f64 745f 005f 5f5f 7374 695f 5f4d 7578 5f63 7878 5f73 6574 496e 6465 785f 005f 5f64 746f 7273 005f 5f63 746f 7273
0647740 005f 5f5f 7374 645f 5f43 6f75 6e74 6572 5f63 7878 5f73 6574 496e 6465 785f 005f 5f5f 7374 645f 5f44 6563 6f64 6572 5f63
0650020 7878 5f73 6574 496e 6465 785f 005f 5f5f 7374 645f 5f47 656e 5661 6c75 655f 6378 785f 6578 706c 6169 6e5f 005f 5f5f 7374
0650100 695f 5f43 6f75 6e74 6572 5f63 7878 5f73 6574 496e 6465 785f 005f 5f5f 7374 695f 5f44 6563 6f64 6572 5f63 7878 5f73 6574
0650160 496e 6465 785f 005f 5f5f 7374 695f 5f47 656e 5661 6c75 655f 6378 785f 6578 706c 6169 6e5f 005f 5f5f 7374 645f 5f61 7474
0650240 7269 6275 7465 5f63 7878 5f00 5f5f 5f73 7469 5f5f 6174 7472 6962 7574 655f 6378 785f 005f 5f5f 7374 645f 5f44 4963 7265
0650320 6d65 6e74 6f72 5f63 7878 5f73 6574 496e 6465 785f 005f 5f5f 7374 695f 5f44 4963 7265 6d65 6e74 6f72 5f63 7878 5f73 6574
0650400 496e 6465 785f 005f 5f5f 7374 645f 5f4d 475f 5370 6563 6966 6963 5f63 7878 5f73 6574 5f74 6563 686e 6f6c 6f67 795f 6e61
0650460 6d65 5f00 5f5f 5f73 7469 5f5f 4d47 5f53 7065 6369 6669 635f 6378 785f 7365 745f 7465 6368 6e6f 6c6f 6779 5f6e 616d 655f
0650540 005f 5f5f 7374 645f 5f46 6966 6f5f 6378 785f 7365 7449 6e64 6578 5f00 5f5f 5f73 7464 5f5f 4d6f 6447 656e 5f63 7878 5f74
0650620 656d 704d 475f 005f 5f5f 7374 645f 5f70 6172 616d 6574 6572 5f63 7878 5f63 7031 5f00 5f5f 5f73 7469 5f5f 4669 666f 5f63
0650700 7878 5f73 6574 496e 6465 785f 005f 5f5f 7374 695f 5f4d 6f64 4765 6e5f 6378 785f 7465 6d70 4d47 5f00 5f5f 5f73 7469 5f5f
0650760 7061 7261 6d65 7465 725f 6378 785f 6370 315f 005f 5f5f 7374 645f 5f41 6c6c 426c 6f63 6b73 5f63 7878 5f65 7870 6c61 696e
0651040 5f00 5f5f 5f73 7469 5f5f 416c 6c42 6c6f 636b 735f 6378 785f 6578 706c 6169 6e5f 005f 5f5f 7374 645f 5f5f 5f5f 7374 7265
0651120 616d 5f73 615f 635f 005f 5f5f 7374 645f 5f62 6c6f 636b 5f63 7878 5f54 656d 705f 005f 5f5f 7374 695f 5f5f 5f5f 7374 7265
0651200 616d 5f73 615f 635f 005f 5f5f 7374 695f 5f62 6c6f 636b 5f63 7878 5f54 656d 705f 005f 5f5f 7374 645f 5f41 6c6c 426c 6f63
0651260 6b73 5f31 5f63 7878 5f6c 7369 6e68 7368 6964 5f00 5f5f 5f73 7464 5f5f 4f62 6a65 6374 5f64 625f 6378 785f 6572 726f 724d
0651340 656d 6f72 795f 005f 5f5f 7374 695f 5f41 6c6c 426c 6f63 6b73 5f31 5f63 7878 5f6c 7369 6e68 7368 6964 5f00 5f5f 5f73 7469
0651420 5f5f 4f62 6a65 6374 5f64 625f 6378 785f 6572 726f 724d 656d 6f72 795f 005f 5f5f 7374 645f 5f41 6464 6572 5f63 7878 5f73
0651500 6574 496e 6465 785f 005f 5f5f 7374 645f 5f46 696c 6555 6e5f 6378 785f 6578 706c 6169 6e5f 005f 5f5f 7374 695f 5f41 6464
0651560 6572 5f63 7878 5f73 6574 496e 6465 785f 005f 5f5f 7374 695f 5f46 696c 6555 6e5f 6378 785f 6578 706c 6169 6e5f 005f 5f5f
0651640 7374 645f 5f6d 6169 6e5f 7665 785f 6378 785f 456e 7469 7479 5f54 7970 655f 4e61 6d65 5f00 5f5f 5f73 7469 5f5f 6d61 696e
0651720 5f76 6578 5f63 7878 5f45 6e74 6974 795f 5479 7065 5f4e 616d 655f 005f 6e65 7874 776f 7264 5f5f 3369 6f73 005f 5072 7445
0652000 7272 005f 436f 7079 4669 6c65 546f 456e 645f 5f31 3049 4f5f 4d61 6e61 6765 7246 7600 5f5f 5f64 745f 5f31 3349 6f73 7472
0652060 6561 6d5f 696e 6974 4676 005f 5f5f 6374 5f5f 3133 496f 7374 7265 616d 5f69 6e69 7446 7600 5f64 6f5f 6f73 6678 5f5f 376f
0652140 7374 7265 616d 4676 005f 646f 5f6f 7066 785f 5f37 6f73 7472 6561 6d46 7600 5f6f 7065 6e70 726f 745f 5f37 6669 6c65 6275
0652220 6600 5f43 6f70 7946 696c 6554 6f4b 6579 575f 5f31 3049 4f5f 4d61 6e61 6765 7246 5063 5431 005f 7370 7269 6e74 6600 5f69
0652300 6e69 7463 6f75 6e74 5f5f 3133 496f 7374 7265 616d 5f69 6e69 7400 5f5f 5f6e 775f 5f46 5569 005f 666f 7065 6e00 5f66 6765
0652360 7473 005f 436f 7079 4669 6c65 546f 4c69 6e65 5f5f 3130 494f 5f4d 616e 6167 6572 4669 005f 666c 6f61 7466 6965 6c64 5f5f
0652440 3369 6f73 005f 5374 6174 6d65 6e74 4861 6e64 656c 6572 5f5f 3130 494f 5f4d 616e 6167 6572 4650 6354 3169 005f 7374 6473
0652520 7461 7475 735f 5f31 3349 6f73 7472 6561 6d5f 696e 6974 005f 6164 6a75 7374 6669 656c 645f 5f33 696f 7300 5f49 4f43 6865
0652600 636b 5f5f 3130 494f 5f4d 616e 6167 6572 4676 005f 5f5f 6374 5f5f 3130 494f 5f4d 616e 6167 6572 4650 6300 5f49 4f41 7578
0652660 005f 494f 5f42 7566 6665 7200 5f73 7464 696f 666c 7573 685f 5f33 696f 7300 5f6e 6578 7462 6974 5f5f 3369 6f73 005f 7374
0652740 725f 616c 6c6f 6300 5f6f 7574 436f 6e00 5f49 4f41 7578 4200 5f49 4f42 7566 6600 5f66 7072 696e 7466 005f 7374 724c 6578
0653020 005f 7374 7263 7079 005f 4561 745f 5374 6174 656d 656e 745f 5f31 3049 4f5f 4d61 6e61 6765 7246 5063 5431 005f 494f 5f41
0653100 7578 6c72 7941 005f 494f 5f41 7578 6c72 7942 005f 6261 7365 6669 656c 645f 5f33 696f 7300 5f73 6574 5f47 656e 5661 6c75
0653160 655f 7479 7065 5f5f 3847 656e 5661 6c75 6546 5063 6900 5f5f 5f6c 735f 5f37 6f73 7472 6561 6d46 6600 5f5f 5f6c 735f 5f37
0653240 6f73 7472 6561 6d46 6900 5f5f 5f70 7462 6c5f 5f38 4c50 4f62 6a65 6374 5f5f 4765 6e56 616c 7565 5f63 7878 005f 5f5f 7674
0653320 626c 5f5f 384c 504f 626a 6563 745f 5f47 656e 5661 6c75 655f 6378 7800 5f5f 5f70 7462 6c5f 5f38 4765 6e56 616c 7565 5f5f
0653400 4765 6e56 616c 7565 5f63 7878 005f 5f5f 7674 626c 5f5f 3847 656e 5661 6c75 6500 5f56 616c 7565 5f54 7970 655f 4e61 6d65
0653460 005f 6578 706c 6169 6e5f 5f38 4765 6e56 616c 7565 4650 6300 5f5f 5f6c 735f 5f37 6f73 7472 6561 6d46 5043 6300 5f5f 5f70
0653540 7462 6c5f 5f36 4f62 6a65 6374 5f5f 4765 6e56 616c 7565 5f63 7878 005f 6368 6563 6b5f 5f38 4765 6e56 616c 7565 4669 005f
0653620 5f5f 7674 626c 5f5f 364f 626a 6563 7400 5f73 7472 636d 7000 5f63 6f75 7400 5f5f 5f70 7462 6c5f 5f36 4f62 6a65 6374 5f5f
0653700 7061 7261 6d65 7465 725f 6378 7800 5f5f 5f70 7462 6c5f 5f36 4d6f 6447 656e 5f5f 7061 7261 6d65 7465 725f 6378 7800 5f5f
0653760 5f70 7462 6c5f 5f36 656e 7469 7479 5f5f 7061 7261 6d65 7465 725f 6378 7800 5f67 6574 5f70 6172 616d 6574 6572 5f50 5852
0654040 4546 5f5f 3970 6172 616d 6574 6572 4631 3050 6172 615f 436c 6173 7300 5f67 6574 5f56 4844 4c5f 466f 726d 616c 5f50 6172
```

```
0654120 616d 5f5f 3970 6172 616d 6574 6572 4650 6369 005f 6765 745f 5648 444c 5f50 726d 7472 5f5f 3970 6172 616d 6574 6572 4650
0654200 6369 005f 6c73 6961 626f 7274 005f 5f5f 7674 626c 5f5f 344c 6973 7400 5f69 646e 746e 005f 7465 6d70 005f 7365 745f 7061
0654260 7261 6d65 7465 725f 6d6f 6465 5f5f 3970 6172 616d 6574 6572 4650 6300 5f5f 5f63 745f 5f37 4e4f 626a 6563 7446 5063 005f
0654340 5648 444c 5f50 696e 5f54 7970 655f 4e61 6d65 005f 5f5f 7074 626c 5f5f 344c 6973 745f 5f70 6172 616d 6574 6572 5f63 7878
0654420 005f 5f5f 7074 626c 5f5f 384c 504f 626a 6563 745f 5f70 6172 616d 6574 6572 5f63 7878 005f 5f5f 7674 626c 5f5f 384c 504f
0654500 626a 6563 745f 5f70 6172 616d 6574 6572 5f63 7878 005f 5f5f 7074 626c 5f5f 3847 656e 5661 6c75 655f 5f70 6172 616d 6574
0654560 6572 5f63 7878 005f 5f5f 7674 626c 5f5f 3562 6c6f 636b 005f 6162 7300 5f5f 5f76 7462 6c5f 5f35 504c 6973 7400 5f73 6574
0654640 5f70 6172 616d 6574 6572 5f50 5852 6566 5f5f 3970 6172 616d 6574 6572 4650 6350 3562 6c6f 636b 005f 6765 745f 5648 444c
0654720 5f45 7870 616e 6465 645f 466f 726d 616c 5f50 6172 616d 5f5f 3970 6172 616d 6574 6572 4650 3562 6c6f 636b 5063 6900 5f74
0655000 656d 7032 005f 6370 3100 5f63 7032 005f 5f5f 7674 626c 5f5f 3970 6172 616d 6574 6572 005f 6964 656e 7461 7469 6f6e 005f
0655060 5f5f 7074 626c 5f5f 3562 6c6f 636b 5f5f 7061 7261 6d65 7465 725f 6378 7800 5f5f 5f70 7462 6c5f 5f35 504c 6973 745f 5f70
0655140 6172 616d 6574 6572 5f63 7878 005f 6765 745f 5648 444c 5f45 7870 616e 6465 645f 5072 6d74 725f 4d61 705f 5f39 7061 7261
0655220 6d65 7465 7246 5035 626c 6f63 6b50 6369 005f 6765 745f 636f 7272 6563 745f 6c65 6e67 7468 5f5f 3970 6172 616d 6574 6572
0655300 4676 005f 6765 745f 5069 6e4c 656e 6774 685f 5f36 4d6f 6447 656e 4650 6300 5f5f 5f70 7462 6c5f 5f39 7061 7261 6d65 7465
0655360 725f 5f70 6172 616d 6574 6572 5f63 7878 005f 6174 6f69 005f 5f5f 7674 626c 5f5f 364d 6f64 4765 6e00 5f5f 5f76 7462 6c5f
0655440 5f36 656e 7469 7479 005f 7374 726c 656e 005f 7374 7263 6174 005f 7365 745f 7061 7261 6d65 7465 725f 7372 616e 6765 5f5f
0655520 3970 6172 616d 6574 6572 4650 6300 5f50 696e 5f54 7970 655f 4e61 6d65 005f 6765 745f 7061 7261 5f6c 656e 6774 685f 5f39
0655600 7061 7261 6d65 7465 7246 7600 5f67 6574 5f70 6172 615f 7374 6174 7573 5f5f 3970 6172 616d 6574 6572 4676 005f 6578 706c
0655660 6169 6e5f 5f39 7061 7261 6d65 7465 7246 5063 005f 6578 706c 6169 6e5f 5f36 656e 7469 7479 4650 6300 5f5f 5f70 7462 6c5f
0655740 5f36 4f62 6a65 6374 5f5f 656e 7469 7479 5f63 7878 005f 5f5f 7074 626c 5f5f 3665 6e74 6974 795f 5f65 6e74 6974 795f 6378
0656020 7800 5f69 734c 5445 5f5f 3665 6e74 6974 7946 5036 4f62 6a65 6374 005f 6973 4754 455f 5f36 656e 7469 7479 4650 364f 626a
0656100 6563 7400 5f45 6e74 6974 795f 5479 7065 5f4e 616d 6500 5f5f 5f70 7462 6c5f 5f34 4c69 7374 5f5f 656e 7469 7479 5f63 7878
0656160 005f 7365 745f 656e 7469 7479 5f74 7970 655f 5f36 656e 7469 7479 4650 6300 5f5f 5f70 7462 6c5f 5f38 4c50 4f62 6a65 6374
0656240 5f5f 656e 7469 7479 5f63 7878 005f 5f5f 7674 626c 5f5f 384c 504f 626a 6563 745f 5f65 6e74 6974 795f 6378 7800 5f5f 5f70
0656320 7462 6c5f 5f35 504c 6973 745f 5f65 6e74 6974 795f 6378 7800 5f5f 5f70 7462 6c5f 5f36 4f62 6a65 6374 5f5f 6174 7472 6962
0656400 7574 655f 6378 7900 5f5f 5f70 7462 6c5f 5f31 3662 6c6f 636b 5f61 7474 7269 6275 7465 735f 5f61 7474 7269 6275 7465 5f63
0656460 7878 005f 5f5f 7674 626c 5f5f 3136 626c 6f63 6b5f 6174 7472 6962 7574 6573 5f5f 6174 7472 6962 7574 655f 6378 7800 5f5f
0656540 5f70 7462 6c5f 5f38 4c50 4f62 6a65 6374 5f5f 6174 7472 6962 7574 655f 6378 7800 5f5f 5f76 7462 6c5f 5f38 4c50 4f62 6a65
0656620 6374 5f5f 6174 7472 6962 7574 655f 6378 7800 5f5f 5f70 7462 6c5f 5f38 4765 6e56 616c 7565 5f5f 6174 7472 6962 7574 655f
0656700 6378 7800 5f69 734c 5445 5f5f 3562 6c6f 636b 4650 364f 626a 6563 7400 5f69 7347 5445 5f5f 3562 6c6f 636b 4650 364f 626a
0656760 6563 7400 5f42 6c6f 636b 5f54 7970 655f 4e61 6d65 005f 7365 745f 626c 6f63 6b5f 7479 7065 5f5f 3562 6c6f 636b 4650 6300
0657040 5f57 5f43 4c5f 456e 7469 7479 4465 635f 5f35 626c 6f63 6b46 7600 5f57 5f4d 475f 4368 6563 6b43 6f6d 705f 5f35 626c 6f63
0657120 6b46 7600 5f57 5f56 4844 4c5f 436f 6d70 4465 635f 5f35 626c 6f63 6b46 7600 5f73 6574 4572 726f 725f 5f35 626c 6f63 6b46
0657200 6300 5f69 734d 656d 6265 725f 5f35 504c 6973 7446 5063 005f 4368 6563 6b50 6172 616d 4c69 7374 5f5f 3562 6c6f 636b 4650
0657260 3550 4c69 7374 005f 5f5f 7074 626c 5f5f 344c 6973 745f 5f62 6c6f 636b 5f63 7878 005f 575f 5648 444c 5f43 6f6d 7049 6e73
0657340 745f 5f35 626c 6f63 6b46 7600 5f74 6f5f 6c6f 7765 7200 5f5f 5f70 7462 6c5f 5f38 4c50 4f62 6a65 6374 5f5f 626c 6f63 6b5f
0657420 6378 7800 5f5f 5f76 7462 6c5f 5f38 4c50 4f62 6a65 6374 5f5f 626c 6f63 6b5f 6378 7800 5f5f 5f70 7462 6c5f 5f38 4765 6e56
0657500 616c 7565 5f5f 626c 6f63 6b5f 6378 7800 5f54 656d 7000 5f42 7566 6665 7200 5f5f 5f70 7462 6c5f 5f35 626c 6f63 6b5f 5f62
0657560 6c6f 636b 5f63 7878 005f 5f5f 7074 626c 5f5f 3550 4c69 7374 5f5f 626c 6f63 6b5f 6378 7800 5f43 6865 636b 5061 7261 4c69
0657640 7374 735f 5f35 626c 6f63 6b46 7600 5f67 6574 5f56 4844 4c5f 436f 6d70 4e61 6d65 5f5f 3562 6c6f 636b 4650 6300 5f57 5f4d
0657720 475f 436f 6d70 4473 6372 7074 6e5f 5f35 626c 6f63 6b46 7600 5f5f 5f70 7462 6c5f 5f39 7061 7261 6165 7465 725f 5f62 6c6f
0660000 636b 5f63 7878 005f 6973 5175 616c 6966 6965 645f 5f35 626c 6f63 6b46 7600 5f70 7269 6e74 6600 5f67 6574 5f4d 6f64 4765
0660060 6e5f 436f 6d70 5074 725f 5f46 5063 5431 005f 6765 745f 636f 6d70 5f6c 656e 6774 685f 5f35 626c 6f63 6b46 7600 5f65 7870
0660140 6c61 696e 5f5f 3550 4c69 7374 4650 6300 5f65 7870 6c61 696e 5f5f 3562 6c6f 636b 4650 6300 5f57 5f43 4c5f 4172 6368 426f
0660220 6479 5f5f 3562 6c6f 636b 4676 005f 5f5f 7074 626c 5f5f 364f 626a 6563 745f 5f62 6c6f 636b 5f63 7878 005f 5f5f 7074 626c
0660300 5f5f 364d 6f64 4765 6e5f 5f62 6c6f 636b 5f63 7878 005f 5f5f 7074 626c 5f5f 3665 6e74 6974 795f 5f62 6c6f 636b 5f63 7878
0660360 005f 6765 745f 5648 444c 5f43 6f6d 704c 6162 6c65 5f5f 3562 6c6f 636b 4650 6300 5f49 4f4d 005f 5f5f 7074 626c 5f5f 3136
0660440 626c 6f63 6b5f 6174 7472 6962 7574 6573 5f5f 626c 6f63 6b5f 6378 7800 5f5f 5f76 7462 6c5f 5f31 3662 6c6f 636b 5f61 7474
0660520 7269 6275 7465 735f 5f62 6c6f 636b 5f63 7878 005f 5f5f 7074 626c 5f5f 384c 504f 626a 6563 745f 5f44 6573 556e 6974 5f63
0660600 7878 005f 5f5f 7674 626c 5f5f 384c 504f 626a 6563 745f 5f44 6573 556e 6974 5f63 7878 005f 5f5f 7074 626c 5f5f 3562 6c6f
0660660 636b 5f5f 4465 7355 6e69 745f 6378 7800 5f5f 5f70 7462 6c5f 5f35 504c 6973 745f 5f44 6573 556e 6974 5f63 7878 005f 5f5f
0660740 6374 5f5f 3130 4465 7369 676e 556e 6974 4650 3665 6e74 6974 7900 5f5f 5f76 7462 6c5f 5f31 3044 6573 6967 6e55 6e69 7400
0661020 5f45 7870 616e 645f 5648 444c 5f44 555f 5f31 3044 6573 6967 6e55 6e69 7446 7600 5f5f 5f70 7462 6c5f 5f36 4f62 6a65 6374
0661100 5f5f 4465 7355 6e69 745f 6378 7800 5f5f 5f70 7462 6c5f 5f36 4d6f 6447 656e 5f5f 4465 7355 6e69 745f 6378 7800 5f5f 5f70
0661160 7462 6c5f 5f36 656e 7469 7479 5f5f 4465 7355 6e69 745f 6378 7800 5f69 734c 5445 5f5f 3130 4465 7369 676e 556e 6974 4650
```

```
0661240   364f 626a 6563 7400 5f69 7347 5445 5f5f 3130 4465 7369 676e 556e 6974 4650 364f 626a 6563 7400 5f73 6574 4e61 6d65 5f5f
0661320   374e 4f62 6a65 6374 4650 6300 5f45 7175 616c 5f5f 3130 4465 7369 676e 556e 6974 4650 3665 6e74 6974 7900 5f5f 5f70 7462
0661400   6c5f 5f31 3044 6573 6967 6e55 6e69 745f 5f44 6573 556e 6974 5f63 7878 005f 5f5f 7074 626c 5f5f 344c 6973 745f 5f44 6573
0661460   556e 6974 5f63 7878 005f 5f5f 7074 626c 5f5f 364f 626a 6563 745f 5f46 696c 6555 6e5f 6378 7800 5f5f 5f70 7462 6c5f 5f36
0661540   4d6f 6447 656e 5f5f 4669 6c65 556e 5f63 7878 005f 5f5f 7074 626c 5f5f 3665 6e74 6974 795f 5f46 696c 6555 6e5f 6378 7800
0661620   5f5f 5f64 6c5f 5f46 5076 005f 5f5f 7674 626c 5f5f 3846 696c 6555 6e69 7400 5f45 7870 616e 645f 5648 444c 5f44 555f 5f38
0661700   4669 6c65 556e 6974 4676 005f 6663 6c6f 7365 005f 5f5f 7074 626c 5f5f 3130 4465 7369 676e 556e 6974 5f5f 4669 6c65 556e
0661760   5f63 7878 005f 5f5f 7074 626c 5f5f 344c 6973 745f 5f46 696c 6555 6e5f 6378 7800 5f65 7870 6c61 696e 5f5f 3846 696c 6555
0662040   6e69 7446 5063 005f 5f5f 7074 626c 5f5f 384c 504f 626a 6563 745f 5f46 696c 6555 6e5f 6378 7800 5f5f 5f76 7462 6c5f 5f38
0662120   4c50 4f62 6a65 6374 5f5f 4669 6c65 556e 5f63 7878 005f 5f5f 7074 626c 5f5f 3846 696c 6555 6e69 745f 5f46 696c 6555 6e5f
0662200   6378 7800 5f5f 5f70 7462 6c5f 5f35 626c 6f63 6b5f 5f46 696c 6555 6e5f 6378 7800 5f5f 5f70 7462 6c5f 5f35 504c 6973 745f
0662260   5f46 696c 6555 6e5f 6378 7800 5f52 6576 6572 7365 5061 7261 6d4c 6973 7473 5f5f 3941 6c6c 426c 6f63 6b73 4676 005f 6d61
0662340   6b65 5f46 554c 6973 745f 5f39 416c 6c42 6c6f 636b 7346 7600 5f6d 616b 655f 4455 4c69 7374 5f5f 3941 6c6c 426c 6f63 6b73
0662420   4676 005f 5f5f 7074 626c 5f5f 364d 6f64 4765 6e5f 5f41 6c6c 426c 6f63 6b73 5f63 7878 005f 5f5f 7074 626c 5f5f 364f 626a
0662500   6563 745f 5f41 6c6c 426c 6f63 6b73 5f63 7878 005f 5f5f 7074 626c 5f5f 3665 6e74 6974 795f 5f41 6c6c 426c 6f63 6b73 5f63
0662560   7878 005f 5f5f 7074 626c 5f5f 3130 4465 7369 676e 556e 6974 5f5f 416c 6c42 6c6f 636b 735f 6378 7800 5f5f 5f70 7462 6c5f
0662640   5f34 4c69 7374 5f5f 416c 6c42 6c6f 636b 735f 6378 7800 5f5f 5f76 7462 6c5f 5f38 4c50 4f62 6a65 6374 5f5f 416c 6c42 6c6f
0662720   636b 735f 6378 7800 5f5f 5f70 7462 6c5f 5f38 4669 6c65 556e 6974 5f5f 416c 6c42 6c6f 636b 735f 6378 7800 5f5f 5f70 7462
0663000   6c5f 5f38 4c50 4f62 6a65 6374 5f5f 416c 6c42 6c6f 636b 735f 6378 7800 5f5f 5f76 7462 6c5f 5f39 416c 6c42 6c6f 636b 7300
0663060   5f5f 5f70 7462 6c5f 5f35 626c 6f63 6b5f 5f41 6c6c 426c 6f63 6b73 5f63 7878 005f 5f5f 7074 626c 5f5f 3550 4c69 7374 5f5f
0663140   416c 6c42 6c6f 636b 735f 6378 7800 5f45 7870 616e 645f 5648 444c 5f46 555f 5f39 416c 6c42 6c6f 636b 7346 7600 5f5f 5f70
0663220   7462 6c5f 5f39 416c 6c42 6c6f 636b 735f 5f41 6c6c 426c 6f63 6b73 5f63 7878 005f 696e 7365 7274 5f5f 3550 4c69 7374 4650
0663300   384c 504f 626a 6563 7400 5f72 6576 6572 7365 5f5f 3550 4c69 7374 4676 005f 536f 7274 5f50 4c69 7374 5f5f 3550 4c69 7374
0663360   4669 005f 6578 706c 6169 6e5f 5f39 416c 6c42 6c6f 636b 7346 5063 005f 6c65 786f 7065 6e00 5f5f 5f70 7462 6c5f 5f34 4c69
0663440   7374 5f5f 416c 6c42 6c6f 636b 735f 315f 6378 7800 5f5f 5f76 7462 6c5f 5f38 4c50 4f62 6a65 6374 5f5f 416c 6c42 6c6f 636b
0663520   735f 315f 6378 7800 5f5f 5f70 7462 6c5f 5f38 4669 6c65 556e 6974 5f5f 416c 6c42 6c6f 636b 735f 315f 6378 7800 5f5f 5f70
0663600   7462 6c5f 5f38 4c50 4f62 6a65 6374 5f5f 416c 6c42 6c6f 636b 735f 315f 6378 7800 5f5f 5f70 7462 6c5f 5f38 4765 6e56 616c
0663660   7565 5f5f 416c 6c42 6c6f 636b 735f 315f 6378 7800 5f6c 6e75 6d00 5f72 6561 645f 7661 6c75 655f 5f46 6954 3150 6300 5f50
0663740   4572 726f 725f 5f46 6954 3150 6300 5f41 005f 4200 5f52 6561 645f 5648 444c 5f42 6c6b 4669 6c65 5f5f 3941 6c6c 426c 6f63
0664020   6b73 4650 6300 5f6c 6578 7265 7377 6400 5f6c 6578 5f66 696c 6500 5f6c 6578 7175 6f74 6500 5f5f 5f70 7462 6c5f 5f35 626c
0664100   6f63 6b5f 5f41 6c6c 426c 6f63 6b73 5f31 5f63 7878 005f 5f5f 7074 626c 5f5f 3550 4c69 7374 5f5f 416c 6c42 6c6f 636b 735f
0664160   315f 6378 7800 5f45 005f 7265 6164 5f74 7970 655f 5f46 6950 6300 5f74 7374 7200 5f5f 5f70 7462 6c5f 5f39 416c 6c42 6c6f
0664240   636b 735f 5f41 6c6c 426c 6f63 6b73 5f31 5f63 7878 005f 5f5f 7074 626c 5f5f 3970 6172 616d 6574 6572 5f5f 416c 6c42 6c6f
0664320   636b 735f 315f 6378 7800 5f74 6f5f 7570 7065 7200 5f4c 005f 6d61 5f63 7572 7265 6e74 5f67 726f 7570 005f 6c65 7863 7265
0664400   6174 6500 5f5f 5f70 7462 6c5f 5f36 4d6f 6447 656e 5f5f 416c 6c42 6c6f 636b 735f 315f 6378 7800 5f5f 5f70 7462 6c5f 5f36
0664460   4f62 6a65 6374 5f5f 416c 6c42 6c6f 636b 735f 315f 6378 7800 5f5f 5f70 7462 6c5f 5f36 656e 7469 7479 5f5f 416c 6c42 6c6f
0664540   636b 735f 315f 6378 7800 5f50 005f 5f5f 7674 626c 5f5f 3136 626c 6f63 6b5f 6174 7472 6962 7574 6573 5f5f 416c 6c42 6c6f
0664620   636b 735f 315f 6378 7800 5f5f 5f70 7462 6c5f 5f31 3662 6c6f 636b 5f61 7474 7269 6275 7465 735f 5f41 6c6c 426c 6f63 6b73
0664700   5f31 5f63 7878 005f 6c65 7867 6574 005f 5600 5f6c 6578 6c69 6e65 7661 7200 5f61 746f 6600 5f5f 5f70 7462 6c5f 5f31 3044
0664760   6573 6967 6e55 6e69 745f 5f41 6c6c 426c 6f63 6b73 5f31 5f63 7878 005f 5f6d 6169 6e00 5f5f 5f70 7462 6c5f 5f31 3044 6573
0665040   6967 6e55 6e69 745f 5f6d 6169 6e5f 7665 785f 6378 7800 5f5f 5f70 7462 6c5f 5f34 4c69 7374 5f5f 6d61 696e 5f76 6578 5f63
0665120   7878 005f 4275 6666 6572 5f41 7272 6179 005f 5f5f 7074 626c 5f5f 384c 504f 626a 6563 745f 5f6d 6169 6e5f 7665 785f 6378
0665200   7800 5f5f 5f76 7462 6c5f 5f38 4c50 4f62 6a65 6374 5f5f 6d61 696e 5f76 6578 5f63 7878 005f 5f5f 7074 626c 5f5f 3847 656e
0665260   5661 6c75 655f 5f6d 6169 6e5f 7665 785f 6378 7800 5f5f 5f70 7462 6c5f 5f38 4669 6c65 556e 6974 5f5f 6d61 696e 5f76 6578
0665340   5f63 7878 005f 5f5f 6474 5f5f 344c 6973 7446 7600 5f5f 5f70 7462 6c5f 5f35 626c 6f63 6b5f 5f6d 6169 6e5f 7665 785f 6378
0665420   7800 5f5f 5f70 7462 6c5f 5f35 504c 6973 745f 5f6d 6169 6e5f 7665 785f 6378 7800 5f73 6574 5f74 6563 686e 6f6c 6f67 795f
0665500   6e61 6465 5f5f 3131 4d47 5f53 7065 6369 6669 6346 5063 005f 5061 7261 5f43 6c61 7373 5f4e 616d 6500 5f5f 5f70 7462 6c5f
0665560   5f39 7061 7261 6d65 7465 725f 5f6d 6169 6e5f 7665 785f 6378 7800 5f5f 5f70 7462 6c5f 5f39 416c 6c42 6c6f 636b 735f 5f6d
0665640   6169 6e5f 7665 785f 6378 7800 5f5f 5f70 7462 6c5f 5f36 4f62 6a65 6374 5f5f 6d61 696e 5f76 6578 5f63 7878 005f 5f5f 7074
0665720   626c 5f5f 364d 6f64 4765 6e5f 5f6d 6169 6e5f 7665 785f 6378 7800 5f5f 5f70 7462 6c5f 5f36 656e 7469 7479 5f5f 6d61 696e
0666000   5f76 6578 5f63 7878 005f 4d47 005f 5f5f 7074 626c 5f5f 3136 626c 6f63 6b5f 6174 7472 6962 7574 6573 5f5f 6d61 696e 5f76
0666060   6578 5f63 7878 005f 5f5f 7674 626c 5f5f 3136 626c 6f63 6b5f 6174 7472 6962 7574 6573 5f5f 6d61 696e 5f76 6578 5f63 7878
0666140   005f 4572 726f 7242 7566 6665 7200 5f61 5f79 6573 005f 745f 6e6f 005f 6c65 786c 6574 7465 7200 5f74 5f79 6573 005f 5f63
0666220   7479 7065 5f00 5f79 6573 6e6f 005f 6c65 785f 7374 7269 6e67 005f 615f 6e6f 005f 5f5f 7074 626c 5f5f 364f 626a 6563 745f
0666300   5f4e 4f62 6a65 6374 5f64 625f 6378 7800 5f5f 5f76 7462 6c5f 5f37 4e4f 626a 6563 745f 5f4e 4f62 6a65 6374 5f64 625f 6378
```

| | | | | | | | | | | | | | | | | | | | | | | | | |
|---|---|---|---|---|---|---|---|---|---|---|---|---|---|---|---|---|---|---|---|---|---|---|---|---|
| 0666360 | 7800 | 5f5f | 5f70 | 7462 | 6c5f | 5f37 | 4e4f | 626a | 6563 | 745f | 5f4e | 4f62 | 6a65 | 6374 | 5f64 | 625f | 6378 | 7800 | 5f65 | 7272 | 6f72 | 4d65 | 6d6f | 7279 |
| 0666440 | 5f5f | 364f | 626a | 6563 | 7446 | 5063 | 5431 | 005f | 5f5f | 7074 | 626c | 5f5f | 364f | 626a | 6563 | 745f | 5f4f | 626a | 6563 | 745f | 6462 | 5f63 | 7878 | 005f |
| 0666520 | 6578 | 706c | 6169 | 6e5f | 5f36 | 4f62 | 6a65 | 6374 | 4650 | 6300 | 5f69 | 7345 | 7175 | 616c | 5f5f | 3550 | 4c69 | 7374 | 4652 | 344c | 6973 | 7400 | 5f69 | 6e73 |
| 0666600 | 6572 | 745f | 5f35 | 504c | 6973 | 7446 | 5235 | 504c | 6973 | 7400 | 5f72 | 656d | 6f76 | 655f | 5f35 | 504c | 6973 | 7446 | 5038 | 4c50 | 4f62 | 6a65 | 6374 | 005f |
| 0666660 | 6973 | 4d65 | 6d62 | 6572 | 5f5f | 3550 | 4c69 | 7374 | 4650 | 374c | 4f62 | 6a65 | 6374 | 005f | 5f5f | 7074 | 626c | 5f5f | 344c | 6973 | 745f | 5f50 | 4c69 | 7374 |
| 0666740 | 5f64 | 625f | 6378 | 7900 | 5f5f | 5f76 | 7462 | 6c5f | 5f38 | 4c50 | 4f62 | 6a65 | 6374 | 5f5f | 504c | 6973 | 745f | 6462 | 5f63 | 7878 | 005f | 5f5f | 7074 | 626c |
| 0667020 | 5f5f | 384c | 504f | 626a | 6563 | 745f | 5f50 | 4c69 | 7374 | 5f64 | 625f | 6378 | 7800 | 5f69 | 6e73 | 6572 | 745f | 5f34 | 4c69 | 7374 | 4650 | 374c | 4f62 | 6a65 |
| 0667100 | 6374 | 005f | 5f5f | 7074 | 626c | 5f5f | 3550 | 4c69 | 7374 | 5f5f | 504c | 6973 | 745f | 6462 | 5f63 | 7878 | 005f | 5f5f | 7074 | 626c | 5f5f | 364f | 626a | 6563 |
| 0667160 | 745f | 5f50 | 4c69 | 7374 | 5f64 | 625f | 6378 | 7800 | 5f69 | 6e73 | 6572 | 7441 | 6674 | 6572 | 5f5f | 3550 | 4c69 | 7374 | 4650 | 384c | 504f | 626a | 6563 | 7454 |
| 0667240 | 3100 | 5f72 | 656d | 6f76 | 655f | 5f35 | 504c | 6973 | 7446 | 5063 | 005f | 5f5f | 7074 | 626c | 5f5f | 384c | 504f | 626a | 6563 | 745f | 5f4c | 6973 | 745f | 6462 |
| 0667320 | 5f63 | 7878 | 005f | 5f5f | 7674 | 626c | 5f5f | 384c | 504f | 626a | 6563 | 745f | 5f4c | 6973 | 745f | 6462 | 5f63 | 7878 | 005f | 6572 | 726f | 724d | 656d | 6f72 |
| 0667400 | 795f | 5f34 | 4c69 | 7374 | 4650 | 6354 | 3100 | 5f5f | 5f79 | 7462 | 6c5f | 5f36 | 4f62 | 6a65 | 6374 | 5f5f | 4c69 | 7374 | 5f64 | 625f | 6378 | 7800 | 5f65 | 7870 |
| 0667460 | 6c61 | 696e | 5f5f | 344c | 6973 | 7446 | 5063 | 005f | 6272 | 6f61 | 6463 | 6173 | 745f | 5f34 | 4c69 | 7374 | 464d | 364f | 626a | 6563 | 7446 | 765f | 7600 | 5f5f |
| 0667540 | 5f70 | 7462 | 6c5f | 5f34 | 4c69 | 7374 | 5f5f | 4c69 | 7374 | 5f64 | 625f | 6378 | 7800 | 5f6c | 7374 | 6669 | 6c65 | 005f | 6c69 | 6e65 | 6e75 | 6d00 | 5f6c | 7374 |
| 0667620 | 6f70 | 656e | 005f | 6c73 | 7470 | 7574 | 7300 | 5f6c | 7369 | 6578 | 6974 | 005f | 7761 | 726e | 756d | 005f | 7365 | 746c | 696e | 6562 | 7566 | 005f | 6272 | 6f77 |
| 0667700 | 7365 | 6c66 | 002e | 7265 | 6d00 | 5f6e | 6577 | 6c69 | 6e65 | 005f | 6e65 | 7779 | 6167 | 6500 | 5f6f | 7074 | 5f73 | 6574 | 005f | 7072 | 7468 | 6561 | 6400 | 5f70 |
| 0667760 | 7274 | 6573 | 756d | 005f | 7061 | 6765 | 6e75 | 6d00 | 5f6c | 7369 | 786f | 6e61 | 626f | 7274 | 005f | 6669 | 6e61 | 6c61 | 7564 | 005f | 6669 | 6c65 | 6e61 | 6d65 |
| 0670040 | 005f | 6670 | 7274 | 6c69 | 6e65 | 005f | 6c69 | 7374 | 005f | 7365 | 7272 | 6e75 | 6d00 | 5f73 | 7472 | 6e63 | 6174 | 005f | 7374 | 726e | 6370 | 7900 | 5f69 | 6e69 |
| 0670120 | 7474 | 696d | 6500 | 5f69 | 6e69 | 7472 | 6169 | 6c00 | 5f69 | 736e | 756d | 6265 | 7200 | 5f74 | 6f74 | 7469 | 6d65 | 005f | 746f | 7465 | 7375 | 6d00 | 5f74 | 6572 |
| 0670200 | 726e | 756d | 005f | 7477 | 6172 | 6e75 | 6d00 | 5f74 | 696e | 656e | 756d | 005f | 7072 | 7464 | 656c | 7461 | 6275 | 6600 | 5f63 | 6461 | 7465 | 005f | 6f75 | 745f |
| 0670260 | 6f66 | 5f6d | 656d | 6f72 | 795f | 6675 | 6e63 | 7469 | 6f6e | 005f | 7670 | 7269 | 6e74 | 6600 | 5f76 | 7072 | 7465 | 7272 | 005f | 7670 | 7574 | 6572 | 7200 | 5f6c |
| 0670340 | 7374 | 636c | 6f73 | 6500 | 5f6c | 7374 | 5f74 | 7970 | 6500 | 5f6c | 696e | 6566 | 6c61 | 6700 | 5f6c | 7374 | 666c | 7573 | 6800 | 5f6c | 7369 | 656e | 7466 | 6e00 |
| 0670420 | 5f6c | 7369 | 656e | 7465 | 7200 | 5f6c | 696e | 6569 | 6e63 | 7200 | 5f6c | 7374 | 7072 | 696e | 7400 | 5f6c | 696e | 6574 | 636e | 7400 | 5f6d | 656d | 5f75 | 7365 |
| 0670500 | 6400 | 5f6d | 6f6e | 5f69 | 6e69 | 7400 | 5f6e | 6577 | 7469 | 746c | 6500 | 5f64 | 6566 | 6f70 | 7469 | 6f6e | 005f | 6f70 | 7474 | 7261 | 696c | 005f | 696e | 7075 |
| 0670560 | 7400 | 5f65 | 6c73 | 7466 | 6c75 | 7368 | 005f | 7061 | 6765 | 666c | 6167 | 005f | 6669 | 6e69 | 746c | 696e | 6500 | 5f6c | 6f70 | 656e | 005f | 7761 | 726e | 005f |
| 0670640 | 736c | 7072 | 696e | 7466 | 005f | 7473 | 6572 | 726e | 756d | 005f | 6464 | 6e61 | 6d65 | 005f | 6470 | 7061 | 6765 | 005f | 7666 | 7072 | 696e | 7466 | 005f | 7673 |
| 0670720 | 7072 | 696e | 7466 | 005f | 6572 | 726e | 756d | 005f | 6c73 | 696f | 7074 | 696f | 6e00 | 5f6c | 6578 | 5f6c | 7369 | 696f | 005f | 6666 | 6c75 | 7368 | 005f | 666c |
| 0671000 | 6f70 | 656e | 005f | 6770 | 6672 | 6565 | 005f | 636c | 6f73 | 6574 | 7261 | 696c | 005f | 6e65 | 7763 | 6f6c | 756d | 6e00 | 5f73 | 7461 | 7473 | 005f | 7365 | 7272 |
| 0671060 | 7300 | 5f69 | 6e66 | 6e75 | 6d00 | 5f69 | 6e6f | 7065 | 6e00 | 5f69 | 6e64 | 6973 | 7000 | 5f5f | 666c | 7362 | 7566 | 005f | 5f66 | 696c | 6275 | 6600 | 2e64 | 6976 |
| 0671140 | 005f | 6d65 | 6d5f | 616c | 6c6f | 6361 | 7465 | 6400 | 5f6d | 656d | 5f65 | 7868 | 6175 | 7374 | 6564 | 005f | 7265 | 7365 | 7468 | 6561 | 6400 | 5f6c | 636c | 6f73 |
| 0671220 | 6500 | 5f69 | 6e63 | 6368 | 636f | 756e | 7400 | 5f63 | 656e | 7465 | 7231 | 005f | 7474 | 796f | 7574 | 7075 | 7400 | 5f6f | 7574 | 7075 | 7400 | 5f76 | 6c73 | 7470 |
| 0671300 | 7269 | 6e74 | 005f | 7075 | 7462 | 7566 | 005f | 7072 | 7465 | 7272 | 005f | 7075 | 7465 | 7272 | 005f | 6175 | 6469 | 745f | 7472 | 6169 | 6c00 | 5f5f | 696f | 6200 |
| 0671360 | 5f66 | 6f70 | 6e61 | 6d65 | 005f | 7161 | 6c6c | 6f63 | 005f | 6770 | 616c | 6c6f | 6300 | 5f6e | 6577 | 7472 | 6169 | 6c65 | 7200 | 5f73 | 7363 | 616e | 6600 | 5f73 |
| 0671440 | 7973 | 7465 | 6d00 | 5f69 | 6e63 | 6c6f | 7365 | 005f | 7072 | 696e | 7474 | 7261 | 696c | 005f | 636f | 7079 | 005f | 7273 | 6574 | 7376 | 7067 | 6e6f | 005f | 6572 |
| 0671520 | 7273 | 005f | 706f | 735f | 6172 | 6700 | 5f66 | 6f70 | 5f66 | 696c | 6500 | 5f64 | 666c | 6f70 | 7469 | 6f6e | 005f | 7365 | 746f | 7074 | 696f | 6e00 | 5f72 | 6561 |
| 0671600 | 645f | 6f70 | 7461 | 626c | 6573 | 005f | 666f | 705f | 6d6f | 6400 | 5f72 | 6561 | 6c74 | 696d | 005f | 6d61 | 726b | 7469 | 6d65 | 005f | 6370 | 7574 | 696d | 005f |
| 0671660 | 746d | 6172 | 6b74 | 696d | 6500 | 5f6c | 6962 | 6669 | 6c65 | 005f | 6672 | 6565 | 005f | 6d6c | 636c | 6f73 | 6500 | 5f70 | 7574 | 7473 | 7472 | 005f | 6661 | 7564 |
| 0671740 | 6e61 | 6d65 | 005f | 6661 | 7564 | 6461 | 7465 | 005f | 666f | 7077 | 7269 | 7465 | 005f | 6669 | 6c65 | 6f70 | 656e | 005f | 6661 | 7564 | 6869 | 7374 | 005f | 6669 |
| 0672020 | 6c65 | 6869 | 7374 | 005f | 6765 | 6e5f | 6365 | 6d62 | 005f | 6765 | 6e5f | 6669 | 6c65 | 005f | 6861 | 7368 | 6e61 | 6d65 | 005f | 7374 | 726e | 636d | 7000 | 5f70 |
| 0672100 | 6172 | 7365 | 5f74 | 7261 | 696c | 005f | 6669 | 6e66 | 6f00 | 5f6d | 6175 | 6464 | 6174 | 6500 | 5f6d | 656d | 625f | 706f | 7300 | 5f6d | 6175 | 6468 | 6973 | 7400 |
| 0672160 | 5f6d | 656d | 6268 | 6973 | 7400 | 5f63 | 6872 | 6f6e | 6d65 | 6d62 | 005f | 6e69 | 6365 | 6461 | 7465 | 005f | 6e65 | 7874 | 5f73 | 7472 | 005f | 6368 | 6563 | 6b5f |
| 0672240 | 7465 | 726d | 5f63 | 6f6c | 6c69 | 7369 | 6f6e | 005f | 6667 | 6574 | 7472 | 6169 | 6c00 | 5f67 | 656e | 5f74 | 7261 | 696c | 005f | 7265 | 7674 | 7261 | 696c | 005f |
| 0672320 | 6175 | 646c | 6962 | 005f | 6d70 | 7574 | 6300 | 5f6d | 6765 | 7463 | 005f | 6d6f | 7065 | 6e00 | 5f6d | 696e | 666f | 005f | 6c73 | 6963 | 686b | 7375 | 6d00 | 5f6d |
| 0672400 | 6765 | 7474 | 7261 | 696c | 005f | 6d65 | 6162 | 7472 | 6169 | 6c00 | 5f70 | 6172 | 7365 | 5f6c | 6962 | 005f | 7061 | 7273 | 655f | 6f70 | 7400 | 5f43 | 4c4e | 414d |
| 0672460 | 4500 | 5f66 | 696c | 655f | 6175 | 6469 | 7400 | 5f61 | 7564 | 6d65 | 6d62 | 005f | 6175 | 6466 | 696c | 6500 | 5f73 | 616d | 6574 | 7261 | 696c | 005f | 6d61 | 6c6c |
| 0672540 | 6f63 | 005f | 6d63 | 6c6f | 7365 | 005f | 6372 | 6461 | 7465 | 005f | 6d6c | 6f70 | 656e | 005f | 7472 | 696d | 7472 | 6169 | 6c00 | 5f74 | 7269 | 6d5f | 6c69 | 7374 |
| 0672620 | 005f | 6465 | 6c74 | 7374 | 7200 | 5f54 | 4e41 | 4d45 | 005f | 666f | 7072 | 6561 | 6400 | 5f66 | 666c | 6f70 | 656e | 005f | 6765 | 6e5f | 6c69 | 6200 | 5f67 | 6574 |
| 0672700 | 7473 | 7472 | 005f | 6765 | 6e5f | 6f70 | 7400 | 5f72 | 6c6f | 7065 | 6e00 | 5f6e | 6578 | 745f | 746c | 6973 | 7400 | 5f65 | 7870 | 616e | 6474 | 7261 | 696c | 005f |
| 0672760 | 7061 | 7273 | 655f | 6465 | 6d62 | 005f | 7061 | 7273 | 655f | 6669 | 6c65 | 005f | 666f | 726d | 6174 | 7472 | 6169 | 6c00 | 5f72 | 6d5f | 6669 | 6c65 | 005f | 6374 |
| 0673040 | 696d | 6500 | 5f66 | 7469 | 6d65 | 005f | 6673 | 7461 | 7400 | 5f74 | 696d | 6500 | 5f6c | 6f63 | 616c | 7469 | 6d65 | 005f | 7469 | 6d65 | 7300 | 5f63 | 6f6e | 7374 |
| 0673120 | 6571 | 005f | 6973 | 6571 | 7561 | 6c00 | 5f75 | 6e6c | 696e | 6b00 | 5f73 | 6861 | 7368 | 696e | 7365 | 7274 | 005f | 736d | 616b | 6574 | 6162 | 005f | 7368 | 6173 |
| 0673200 | 6867 | 6574 | 005f | 6873 | 6868 | 7368 | 626c | 6f63 | 6b00 | 5f6d | 615f | 6672 | 6565 | 005f | 676d | 616b | 6574 | 6162 | 005f | 6768 | 6173 | 6861 | 6374 | 005f |
| 0673260 | 6768 | 6173 | 6867 | 6574 | 005f | 7068 | 6173 | 6864 | 656c | 6574 | 6500 | 5f70 | 6861 | 7368 | 696e | 7365 | 7274 | 005f | 6874 | 5f67 | 6574 | 5f6e | 6578 | 745f |
| 0673340 | 656c | 656d | 656e | 7400 | 5f67 | 6861 | 7368 | 616e | 616c | 797a | 6500 | 5f73 | 6861 | 7368 | 6465 | 6c65 | 7465 | 005f | 6d61 | 5f61 | 6c6c | 6f63 | 005f | 706d |
| 0673420 | 616b | 6574 | 6162 | 005f | 7068 | 6173 | 6861 | 6374 | 005f | 7068 | 6173 | 6867 | 6574 | 005f | 6d61 | 5f70 | 6f70 | 5f67 | 726f | 7570 | 005f | 6762 | 6d61 | 6b65 |

```
0673500 7461 6200 5f73 6861 7368 6163 7400 5f70 6861 7368 616e 616c 797a 6500 5f68 745f 6d61 6b65 5f74 6162 6c65 005f 6874 5f69
0673560 735f 656c 656d 656e 7400 5f73 6861 7368 616e 616c 797a 6500 5f70 626d 616b 6574 6162 005f 6874 5f64 656c 6574 655f 656c
0673640 656d 656e 7400 5f68 745f 696e 7365 7274 5f65 6c65 6d65 6e74 005f 6d61 5f70 7573 685f 6772 6f75 7000 5f6e 6f63 7079 6873
0673720 6862 6c6f 636b 005f 6e6f 6672 6568 7368 626c 6f63 6b00 5f73 626d 616b 6574 6162 005f 6874 5f6d 616b 655f 706f 696e 7465
0674000 725f 7461 626c 6500 5f68 745f 6765 745f 656c 656d 656e 7400 5f63 6d70 6873 6862 6c6f 636b 005f 6370 7968 7368 626c 6f63
0674060 6b00 5f66 7265 6873 6862 6c6f 636b 005f 6768 6173 6864 656c 6574 6500 5f67 6861 7368 696e 7365 7274 005f 6c69 6274 726f
0674140 6e00 5f6d 756e 6765 7463 005f 6464 656c 6574 6500 5f6d 7072 696e 7466 005f 6c69 626c 6573 7366 005f 6c69 6273 6f70 656e
0674220 005f 6c69 7374 736f 7274 005f 6c69 6263 7279 7074 005f 7365 746d 656d 6264 6174 6500 5f66 7365 656b 005f 6d65 6d62 6461
0674300 7465 005f 6d65 6462 6475 6d70 005f 6670 5f61 6374 7561 6c00 5f6c 7369 7a65 005f 6c6e 616d 6500 5f6d 6772 6162 005f 6d72
0674360 6561 6400 5f6c 6962 7265 6173 6f6e 005f 6c69 6263 6f6d 7061 7400 5f66 7363 616e 6600 5f6d 7772 6974 6500 5f6c 6578 5f6d
0674440 656d 6265 7200 5f66 6f70 5f70 6964 005f 6765 7470 6173 7300 5f6c 6962 5f66 7265 655f 6279 7465 7300 5f66 705f 6578 7065
0674520 6374 6564 005f 6c65 7867 7261 6200 5f6c 6578 6c6f 6164 005f 6c65 7863 6861 7200 5f6c 6578 776f 726b 6675 6e63 005f 6c65
0674600 786c 6368 6172 005f 6c65 7875 6e61 7279 005f 6c65 785f 7465 726d 696e 616c 005f 6c65 7872 6561 736f 6e00 5f6c 6578 7277
0674660 6f72 6473 005f 6c65 786e 6f6e 6573 7400 5f6c 6578 6572 7266 756e 6300 5f6c 6578 636f 6465 6e75 6d00 5f6c 6578 696e 7365
0674740 6e73 6974 6976 6500 5f66 6f70 7374 6174 6500 5f66 6f70 5f63 6173 6500 5f66 6f70 5f74 696d 6500 5f66 6f70 5f74 6563 6800
0675020 5f66 6f70 5f61 7474 7200 5f66 6f70 5f61 6363 7400 5f66 6f70 7368 6f72 746e 616d 6500 5f66 6f70 5f79 7369 7a65 005f 666f
0675100 705f 7873 697a 6500 5f66 6f70 5f74 7261 6365 005f 6765 7465 6e76 005f 666f 705f 6469 6500 5f66 6f70 5f70 7265 005f 666f
0675160 705f 7375 6600 5f66 6f70 5f76 6572 005f 666f 705f 696f 7069 7463 6800 5f65 685f 7075 7368 5f68 616e 646c 6572 005f 6d61
0675240 5f67 7061 6c5f 6861 6e64 6c65 7200 5f7a 7161 6c6c 6f63 005f 6d61 5f6d 656d 5f61 6c6c 6f63 6174 6564 005f 6d61 5f7a 616c
0675320 6c6f 6300 5f6d 615f 7665 7269 6679 005f 6568 5f70 6173 735f 6578 6365 7074 696f 6e00 5f6d 615f 706f 705f 6e5f 6672 6565
0675400 005f 6d61 5f67 6574 5f67 726f 7570 5f6d 6561 6f72 795f 7573 6564 005f 7769 6c64 5f77 7269 7465 5f63 6865 636b 005f 6d61
0675460 5f72 6574 7279 5f61 6c6c 6f63 005f 6d61 5f6d 616b 655f 6e5f 7075 7368 005f 6c73 6973 6f72 7400 5f73 7472 696e 6773 6f72
0675540 7400 5f68 6173 6873 6f72 7400 5f69 6e63 6861 7368 636f 756e 7400 5f62 7569 6c64 6172 7261 7900 5f43 6f6d 706f 7365 5f4d
0675620 6f64 4765 6e5f 4465 7363 7269 7074 6f72 5f5f 3541 6464 6572 4650 6300 5f4c 6f61 645f 5648 444c 5f44 6174 615f 5f35 4164
0675700 6465 7246 5037 4e4f 626a 6563 7400 5f73 6574 496e 6465 785f 5f35 4164 6465 7246 7600 5f5f 5f70 7462 6c5f 5f31 3044 6573
0675760 6967 6e55 6e69 745f 5f41 6464 6572 5f63 7878 005f 5f5f 7074 626c 5f5f 384c 6973 745f 5f41 6464 6572 5f63 7878 005f 5f5f
0676040 7074 626c 5f5f 384c 504f 626a 6563 745f 5f41 6464 6572 5f63 7878 005f 5f5f 7674 626c 5f5f 384c 504f 626a 6563 745f 5f41
0676120 6464 6572 5f63 7878 005f 5f5f 7074 626c 5f5f 3847 656e 5661 6c75 655f 5f41 6464 6572 5f63 7878 005f 5f5f 7074 626c 5f5f
0676200 3846 696c 6555 6e69 745f 5f41 6464 6572 5f63 7878 005f 5f5f 7674 626c 5f5f 3541 6464 6572 005f 5f5f 7074 626c 5f5f 3562
0676260 6c6f 636b 5f5f 4164 6465 725f 6378 7800 5f5f 5f70 7462 6c5f 5f35 4164 6465 725f 5f41 6464 6572 5f63 7878 005f 5f5f 7074
0676340 626c 5f5f 3550 4c69 7374 5f5f 4164 6465 725f 6378 7800 5f73 6574 5f50 696e 4c65 6e67 7468 5f5f 364d 6f64 4765 6e46 5063
0676420 5431 005f 5f5f 7074 626c 5f5f 3970 6172 616d 6574 6572 5f5f 4164 6465 725f 6378 7800 5f5f 5f70 7462 6c5f 5f39 416c 6c42
0676500 6c6f 636b 735f 5f41 6464 6572 5f63 7878 005f 6765 745f 6c62 735f 7465 6368 4e75 6d5f 5f31 314d 475f 5370 6563 6966 6963
0676560 4676 005f 6578 706c 6169 6e5f 5f36 4d6f 6447 656e 4676 005f 7465 6d70 4d47 005f 5f5f 7074 626c 5f5f 364f 626a 6563 745f
0676640 5f41 6464 6572 5f63 7878 005f 5f5f 7074 626c 5f5f 364d 6f64 4765 6e5f 5f41 6464 6572 5f63 7878 005f 5f5f 7074 626c 5f5f
0676720 3665 6e74 6974 795f 5f41 6464 6572 5f63 7878 005f 5f5f 7074 626c 5f5f 3136 626c 6f63 6b5f 6174 7472 6962 7574 6573 5f5f
0677000 4164 6465 725f 6378 7800 5f5f 5f76 7462 6c5f 5f31 3662 6c6f 636b 5f61 7474 7269 6275 7465 735f 5f41 6464 6572 5f63 7878
0677060 005f 5f5f 7674 626c 5f5f 334d 7578 005f 5f5f 7074 626c 5f5f 3562 6c6f 636b 5f5f 4d75 785f 6378 7800 5f5f 5f70 7462 6c5f
0677140 5f35 504c 6973 745f 5f4d 7578 5f63 7878 005f 5f5f 7074 626c 5f5f 3970 6172 616d 6574 6572 5f5f 4d75 785f 6378 7800 5f5f
0677220 5f70 7462 6c5f 5f39 416c 6c42 6c6f 636b 735f 5f4d 7578 5f63 7878 005f 5f5f 7074 626c 5f5f 364f 626a 6563 745f 5f4d 7578
0677300 5f63 7878 005f 5f5f 7074 626c 5f5f 364d 6f64 4765 6e5f 5f4d 7578 5f63 7878 005f 5f5f 7074 626c 5f5f 3665 6e74 6974 795f
0677360 5f4d 7578 5f63 7878 005f 5f5f 7074 626c 5f5f 3136 626c 6f63 6b5f 6174 7472 6962 7574 6573 5f5f 4d75 785f 6378 7800 5f5f
0677440 5f76 7462 6c5f 5f31 3662 6c6f 636b 5f61 7474 7269 6275 7465 735f 5f4d 7578 5f63 7878 005f 436f 6d70 6f73 655f 4d6f 6447
0677520 656e 5f44 6573 6372 6970 746f 725f 5f33 4d75 7846 5063 005f 5f5f 7074 626c 5f5f 334d 7578 5f5f 4d75 785f 6378 7800 5f4c
0677600 6f61 645f 5648 444c 5f44 6174 615f 5f33 4d75 7846 5037 4e4f 626a 6563 7400 5f73 6574 496e 6465 785f 5f33 4d75 7846 7600
0677660 5f5f 5f70 7462 6c5f 5f31 3044 6573 6967 6e55 6e69 745f 5f4d 7578 5f63 7878 005f 5f5f 7074 626c 5f5f 384c 6973 745f 5f4d
0677740 7578 5f63 7878 005f 5f5f 7074 626c 5f5f 384c 504f 626a 6563 745f 5f4d 7578 5f63 7878 005f 5f5f 7674 626c 5f5f 384c 504f
0700020 626a 6563 745f 5f4d 7578 5f63 7878 005f 5f5f 7074 626c 5f5f 3847 656e 5661 6c75 655f 5f4d 7578 5f63 7878 005f 5f5f 7074
0700100 626c 5f5f 3846 696c 6555 6e69 745f 5f4d 7578 5f63 7878 005f 5f5f 7074 626c 5f5f 384c 504f 626a 6563 745f 5f43 6f75 6e74
0700160 6572 5f63 7878 005f 5f5f 7674 626c 5f5f 384c 504f 626a 6563 745f 5f43 6f75 6e74 6572 5f63 7878 005f 5f5f 7074 626c 5f5f
0700240 3847 656e 5661 6c75 655f 5f43 6f75 6e74 6572 5f63 7878 005f 5f5f 7074 626c 5f5f 3846 696c 6555 6e69 745f 5f43 6f75 6e74
0700320 6572 5f63 7878 005f 5f5f 7674 626c 5f5f 3743 6f75 6e74 6572 005f 5f5f 7074 626c 5f5f 3562 6c6f 636b 5f5f 436f 756e 7465
0700400 725f 6378 7800 5f5f 5f70 7462 6c5f 5f35 504c 6973 745f 5f43 6f75 6e74 6572 5f63 7878 005f 5f5f 7074 626c 5f5f 3970 6172
0700460 616d 6574 6572 5f5f 436f 756e 7465 725f 6378 7800 5f5f 5f70 7462 6c5f 5f39 416c 6c42 6c6f 636b 735f 5f43 6f75 6e74 6572
0700540 5f63 7878 005f 5f5f 7074 626c 5f5f 364f 626a 6563 745f 5f43 6f75 6e74 6572 5f63 7878 005f 5f5f 7074 626c 5f5f 364d 6f64
```

```
0700620  4765 6e5f 5f43 6f75 6e74 6572 5f63 7878 005f 5f5f 7074 626c 5f5f 3665 6e74 6974 795f 5f43 6f75 6e74 6572 5f63 7878 005f
0700700  5f5f 7074 626c 5f5f 3136 626c 6f63 6b5f 6174 7472 6962 7574 6573 5f5f 436f 756e 7465 725f 6378 7800 5f5f 5f76 7462 6c5f
0700760  5f31 3662 6c6f 636b 5f61 7474 7269 6275 7465 735f 5f43 6f75 6e74 6572 5f63 7878 005f 436f 6d70 6f73 655f 4d6f 6447 656e
0701040  5f44 6573 6372 6970 746f 725f 5f37 436f 756e 7465 7246 5063 005f 4c6f 6164 5f56 4844 4c5f 4461 7461 5f5f 3743 6f75 6e74
0701120  6572 4650 374e 4f62 6a65 6374 005f 5f5f 7074 626c 5f5f 3743 6f75 6e74 6572 5f5f 436f 756e 7465 725f 6378 7800 5f73 6574
0701200  496e 6465 785f 5f37 436f 756e 7465 7246 7600 5f5f 5f70 7462 6c5f 5f31 3044 6573 6967 6e55 6e69 745f 5f43 6f75 6e74 6572
0701260  5f63 7878 005f 5f5f 7074 626c 5f5f 344c 6973 745f 5f43 6f75 6e74 6572 5f63 7878 005f 5f5f 7074 626c 5f5f 384c 504f 626a
0701340  6563 745f 5f44 6563 6f64 6572 5f63 7878 005f 5f5f 7674 626c 5f5f 384c 504f 626a 6563 745f 5f44 6563 6f64 6572 5f63 7878
0701420  005f 5f5f 7074 626c 5f5f 3847 656e 5661 6c75 655f 5f44 6563 6f64 6572 5f63 7878 005f 5f5f 7074 626c 5f5f 3846 696c 6555
0701500  6e69 745f 5f44 6563 6f64 6572 5f63 7878 005f 5f5f 7674 626c 5f5f 3744 6563 6f64 6572 005f 5f5f 7074 626c 5f5f 3562 6c6f
0701560  636b 5f5f 4465 636f 6465 725f 6378 7800 5f5f 5f70 7462 6c5f 5f35 504c 6973 745f 5f44 6563 6f64 6572 5f63 7878 005f 5f5f
0701640  7074 626c 5f5f 3970 6172 616d 6574 6572 5f5f 4465 636f 6465 725f 6378 7800 5f5f 5f70 7462 6c5f 5f39 416c 6c42 6c6f 636b
0701720  735f 5f44 6563 6f64 6572 5f63 7878 005f 5f5f 7074 626c 5f5f 364f 626a 6563 745f 5f44 6563 6f64 6572 5f63 7878 005f 5f5f
0702000  7074 626c 5f5f 364d 6f64 4765 6e5f 5f44 6563 6f64 6572 5f63 7878 005f 5f5f 7074 626c 5f5f 3665 6e74 6974 795f 5f44 6563
0702060  6f64 6572 5f63 7878 005f 5f5f 7074 626c 5f5f 3136 626c 6f63 6b5f 6174 7472 6962 7574 6573 5f5f 4465 636f 6465 725f 6378
0702140  7800 5f5f 5f76 7462 6c5f 5f31 3662 6c6f 636b 5f61 7474 7269 6275 7465 735f 5f44 6563 6f64 6572 5f63 7878 005f 436f 6d70
0702220  6f73 655f 4d6f 6447 656e 5f44 6573 6372 6970 746f 725f 5f37 4465 636f 6465 7246 5063 005f 4c6f 6164 5f56 4844 4c5f 4461
0702300  7461 5f5f 3744 6563 6f64 6572 4650 374e 4f62 6a65 6374 005f 5f5f 7074 626c 5f5f 3744 6563 6f64 6572 5f5f 4465 636f 6465
0702360  725f 6378 7800 5f73 6574 496e 6465 785f 5f37 4465 636f 6465 7246 7600 5f5f 5f70 7462 6c5f 5f31 3044 6573 6967 6e55 6e69
0702440  745f 5f44 6563 6f64 6572 5f63 7878 005f 5f5f 7074 626c 5f5f 344c 6973 745f 5f44 6563 6f64 6572 5f63 7878 005f 5f5f 7074
0702520  626c 5f5f 344c 6973 745f 5f44 4963 7265 6d65 6e74 6f72 5f63 7878 005f 4c6f 6164 5f56 4844 4c5f 4461 7461 5f5f 3131 4449
0702600  6372 656d 656e 746f 7246 5037 4e4f 626a 6563 7400 5f5f 5f70 7462 6c5f 5f38 4c50 4f62 6a65 6374 5f5f 4449 6372 656d 656e
0702660  746f 725f 6378 7800 5f5f 5f76 7462 6c5f 5f38 4c50 4f62 6a65 6374 5f5f 4449 6372 656d 656e 746f 725f 6378 7800 5f5f 5f70
0702740  7462 6c5f 5f38 4765 6e56 616c 7565 5f5f 4449 6372 656d 656e 746f 725f 6378 7800 5f5f 5f70 7462 6c5f 5f38 4669 6c65 556e
0703020  6974 5f5f 4449 6372 656d 656e 746f 725f 6378 7800 5f73 6574 496e 6465 785f 5f31 3144 4963 7265 6d65 6e74 6f72 4676 005f
0703100  5f5f 7074 626c 5f5f 3131 4449 6372 656d 656e 746f 725f 5f44 4963 7265 6d65 6e74 6f72 5f63 7878 005f 5f5f 7074 626c 5f5f
0703160  3562 6c6f 636b 5f5f 4449 6372 656d 656e 746f 725f 6378 7800 5f5f 5f70 7462 6c5f 5f35 504c 6973 745f 5f44 4963 7265 6d65
0703240  6e74 6f72 5f63 7878 005f 696e 6465 7800 5f5f 5f70 7462 6c5f 5f39 7061 7261 6d65 7465 725f 5f44 4963 7265 6d65 6e74 6f72
0703320  5f63 7878 005f 5f5f 7074 626c 5f5f 3941 6c6c 426c 6f63 6b73 5f5f 4449 6372 656d 656e 746f 725f 6378 7800 5f5f 5f76 7462
0703400  6c5f 5f31 3144 4963 7265 6d65 6e74 6f72 005f 5f5f 7074 626c 5f5f 364f 626a 6563 745f 5f44 4963 7265 6d65 6e74 6f72 5f63
0703460  7878 005f 5f5f 7074 626c 5f5f 364d 6f64 4765 6e5f 5f44 4963 7265 6d65 6e74 6f72 5f63 7878 005f 5f5f 7074 626c 5f5f 3665
0703540  6e74 6974 795f 5f44 4963 7265 6d65 6e74 6f72 5f63 7878 005f 5f5f 7074 626c 5f5f 3136 626c 6f63 6b5f 6174 7472 6962 7574
0703620  6573 5f5f 4449 6372 656d 656e 746f 725f 6378 7800 5f5f 5f76 7462 6c5f 5f31 3662 6c6f 636b 5f61 7474 7269 6275 7465 735f
0703700  5f44 4963 7265 6d65 6e74 6f72 5f63 7878 005f 436f 6d70 6f73 655f 4d6f 6447 656e 5f44 6573 6372 6970 746f 725f 5f31 3144
0703760  4963 7265 6d65 6e74 6f72 4650 6300 5f5f 5f70 7462 6c5f 5f31 3044 6573 6967 6e55 6e69 745f 5f44 4963 7265 6d65 6e74 6f72
0704040  5f63 7878 005f 5f5f 7074 626c 5f5f 3130 4465 7369 676e 556e 6974 725f 4669 666f 5f63 7878 005f 5f5f 7074 626c 5f5f 3446
0704120  6966 6f5f 5f46 6966 6f5f 6378 7800 5f5f 5f70 7462 6c5f 5f34 4c69 7374 5f5f 4669 666f 5f63 7878 005f 5f5f 7074 626c 5f5f
0704200  384c 504f 626a 6563 745f 5f46 6966 6f5f 6378 7800 5f5f 5f76 7462 6c5f 5f38 4c50 4f62 6a65 6374 5f5f 4669 666f 5f63 7878
0704260  005f 5f5f 7074 626c 5f5f 3847 656e 5661 6c75 655f 5f46 6966 6f5f 6378 7800 5f5f 5f70 7462 6c5f 5f38 4669 6c65 556e 6974
0704340  5f5f 4669 666f 5f63 7878 005f 5f5f 7674 626c 5f5f 3446 6966 6f00 5f5f 5f70 7462 6c5f 5f35 626c 6f63 6b5f 5f46 6966 6f5f
0704420  6378 7800 5f5f 5f70 7462 6c5f 5f35 504c 6973 745f 5f46 6966 6f5f 6378 7800 5f5f 5f70 7462 6c5f 5f39 7061 7261 6d65 7465
0704500  725f 5f46 6966 6f5f 6378 7800 5f5f 5f70 7462 6c5f 5f39 416c 6c42 6c6f 636b 735f 5f46 6966 6f5f 6378 7800 5f5f 5f70 7462
0704560  6c5f 5f36 4f62 6a65 6374 5f5f 4669 666f 5f63 7878 005f 5f5f 7074 626c 5f5f 364d 6f64 4765 6e5f 5f46 6966 6f5f 6378 7800
0704640  5f5f 5f70 7462 6c5f 5f36 656e 7469 7479 5f5f 4669 666f 5f63 7878 005f 5f5f 7074 626c 5f5f 3136 626c 6f63 6b5f 6174 7472
0704720  6962 7574 6573 5f5f 4669 666f 5f63 7878 005f 5f5f 7674 626c 5f5f 3136 626c 6f63 6b5f 6174 7472 6962 7574 6573 5f5f 4669
0705000  666f 5f63 7878 005f 436f 6d70 6f73 655f 4d6f 6447 656e 5f44 6573 6372 6970 746f 725f 5f34 4669 666f 4650 6300 5f4c 6f61
0705060  645f 5648 444c 5f44 6174 615f 5f34 4669 666f 4650 374e 4f62 6a65 6374 005f 7365 7449 6e64 6578 5f5f 3446 6966 6f46 7600
0705140  5f67 6574 5f4d 6561 5f74 6563 684e 756d 5f5f 3131 4d47 5f53 7065 6369 6669 6346 7600 5f5f 5f70 7462 6c5f 5f36 4d6f 6447
0705220  656e 5f5f 4d6f 6447 656e 5f63 7878 005f 5f5f 7074 626c 5f5f 364f 626a 6563 745f 5f4d 6f64 4765 6e5f 6378 7800 5f5f 5f70
0705300  7462 6c5f 5f34 4c69 7374 5f5f 4d6f 6447 656e 5f63 7878 005f 5f5f 7674 626c 5f5f 384c 504f 626a 6563 745f 5f4d 6f64 4765
0705360  6e5f 6378 7800 5f5f 5f70 7462 6c5f 5f38 4c50 4f62 6a65 6374 5f5f 4d6f 6447 656e 5f63 7878 005f 5f5f 7074 626c 5f5f 3550
0705440  4c69 7374 5f5f 446f 6447 656e 5f63 7878 005f 6765 745f 495f 5369 6e4c 656e 6774 685f 5f39 5069 6e4c 656e 6774 6846 6900
0705520  5f5f 5f70 7462 6c5f 5f35 4164 6465 725f 5f4d 475f 4d61 6e61 6765 725f 6378 7800 5f5f 5f70 7462 6c5f 5f35 504c 6973 745f
0705600  5f4d 475f 4d61 6e61 6765 725f 6378 7800 5f5f 5f70 7462 6c5f 5f36 4f62 6a65 6374 5f5f 4d47 5f4d 616e 6167 6572 5f63 7878
0705660  005f 5f5f 7074 626c 5f5f 364d 6f64 4765 6e5f 5f4d 475f 4d61 6e61 6765 725f 6378 7800 5f5f 5f70 7462 6c5f 5f33 4d75 785f
```

```
0705740 5f4d 475f 4d61 6e61 6765 725f 6378 7800 5f5f 5f70 7462 6c5f 5f37 436f 756e 7465 725f 5f4d 475f 4d61 6e61 6765 725f 6378
0706020 7800 5f5f 5f70 7462 6c5f 5f37 4465 636f 6465 725f 5f4d 475f 4d61 6e61 6765 725f 6378 7800 5f5f 5f70 7462 6c5f 5f34 4669
0706100 666f 5f5f 4d47 5f4d 616e 6167 6572 5f63 7878 005f 5f5f 7074 626c 5f5f 344c 6973 745f 5f4d 475f 4d61 6e61 6765 725f 6378
0706160 7800 5f5f 5f70 7462 6c5f 5f38 4c50 4f62 6a65 6374 5f5f 4d47 5f4d 616e 6167 6572 5f63 7878 005f 5f5f 7674 626c 5f5f 384c
0706240 504f 626a 6563 745f 5f4d 475f 4d61 6e61 6765 725f 6378 7800 5f5f 5f70 7462 6c5f 5f31 3144 4963 7265 6d65 6e74 6f72 5f5f
0706320 4d47 5f4d 616e 6167 6572 5f63 7878 005f 6162 6f72 7400 5f73 7472 6369 7200 5f65 685f 7374 6163 6b5f 7373 5f6c 6f67 005f
0706400 6568 5f67 6574 5f65 7863 6570 7469 6f6e 5f66 6f72 6d61 7400 5f6d 6c5f 616c 6c6f 6300 5f65 685f 6973 5f73 7461 636b 5f65
0706460 6d70 7479 005f 6568 5f70 6f70 5f68 616e 646c 6572 005f 6568 5f72 6169 7365 5f65 7863 6570 7469 6f6e 005f 6568 5f64 6566
0706540 6175 6c74 5f68 616e 646c 6572 005f 6568 5f64 616b 655f 6578 6365 7074 696f 6e00 5f6d 6c5f 6672 6565 005f 6d61 5f69 6e69
0706620 7469 616c 697a 655f 6772 6f75 705f 666f 725f 6765 6e65 7261 6c5f 6672 6565 005f 6d61 5f67 6574 5f6d 656d 6f72 795f 7573
0706700 6564 005f 6d61 5f67 6574 5f67 726f 7570 5f6c 6162 656c 005f 6d61 5f73 6574 5f67 726f 7570 5f6c 6162 656c 005f 6d61 5f63
0706760 5f6d 7061 7265 5f70 6f69 6e74 6572 005f 6d61 5f69 735f 6772 6f75 7000 5f6d 615f 7475 726e 5f6f 6666 5f66 7265 655f 6368
0707040 6563 6b00 5f6d 615f 6973 5f70 6f69 6e74 6572 5f69 6e5f 6772 6f75 7000 5f6d 615f 7379 7374 656d 5f61 6c6c 6f63 005f 6d61
0707120 5f73 7065 6369 616c 5f66 6c61 6700 5f6d 615f 6770 5f66 696c 6c5f 666c 6167 005f 6d61 5f74 7572 6e5f 6f6e 5f66 696c 6c00
0707200 5f6d 615f 7665 7269 6679 5f67 726f 7570 005f 6d61 5f68 6173 685f 706f 696e 7465 7200 5f6d 615f 6465 6661 756c 745f 6772
0707260 6f75 7000 5f6d 615f 6766 6672 6565 005f 6d61 5f69 6e69 7469 616c 697a 655f 6772 6f75 705f 666f 725f 6e6f 5f66 7265 6500
0707340 5f6d 615f 6973 5f70 6f69 6e74 6572 005f 6d61 5f73 756d 005f 6d61 5f67 6574 5f6e 6578 745f 6772 6f75 7000 5f6d 615f 6766
0707420 7665 7269 6679 5f67 726f 7570 005f 6d61 5f67 6661 6c6c 6f63 005f 6d61 5f62 6c6b 6669 6c6c 005f 6d61 5f74 7572 6e5f 6f6e
0707500 5f66 7265 655f 6368 6563 6b00 5f6d 615f 7475 726e 5f6f 6e5f 7061 6400 5f6d 615f 6770 5f70 6164 5f66 6c61 6700 5f6d 615f
0707560 636f 756e 745f 6772 6f75 7000 5f6d 615f 6e66 6672 6565 005f 6d61 5f6e 6676 6572 6966 795f 6772 6f75 7000 5f6d 615f 6e66
0707640 616c 6c6f 6300 5f68 745f 6973 5f74 6162 6c65 005f 6874 5f76 6572 6966 795f 7461 626c 6500 5f73 745f 6861 7368 5f73 7472
0707720 696e 6700 5f68 745f 6765 745f 636f 756e 7400 5f73 745f 696e 7365 7274 5f73 7472 696e 675f 7461 626c 6500 5f68 745f 6d61
0710000 6b65 5f73 7472 696e 675f 7461 626c 6500 5f68 745f 6672 6565 5f74 6162 6c65 005f 6874 5f72 6570 6c61 6365 5f65 6c65 6d65
0710060 6e74 005f 7374 5f63 6f6e 7665 7274 5f63 6861 725f 746f 5f6e 756d 6265 7200 5f73 745f 6973 5f61 6c70 6861 6e75 6d65 7269
0710140 6300 5f73 745f 6973 5f61 6c70 6861 005f 7374 5f69 735f 7370 6163 6500 5f73 745f 6973 5f75 7070 6572 005f 7374 5f69 735f
0710220 6c6f 7765 7200 5f73 745f 6973 5f64 6967 6974 005f 7374 5f63 6f6d 7061 7265 5f6e 616d 6500 5f73 745f 7570 7065 7263 6173
0710300 655f 7374 7269 6e67 005f 7374 5f6c 6f77 6572 6361 7365 5f73 7472 696e 6700 5f73 745f 636f 6e63 6174 5f73 7472 696e 6700
0710360 2e73 7472 6574 3400 5f73 745f 636f 6d70 6172 655f 6e6f 6361 7365 5f73 7472 696e 6700 5f73 745f 636f 6d70 6172 655f 7374
0710440 7269 6e67 005f 7374 5f75 7070 6572 6361 7365 5f63 6861 7200 5f73 745f 6c6f 7765 7263 6173 655f 6368 6172 0000 2f75 7372
0710520 2f43 432f 7375 6e34 2f00 0000 0003 917c 8000 0000 0000 0001 0003 916c 0003 917e 8000 0000 0001 0003 0000 0000 4300 6300
0710600 0000 0000 0000 0000 0000 0000 0000 0000 0000 0000 0000 0000 0000 0000 0000 0000 0000 0000 0000 0000 0000 0000 0000 0000
*
0717760 0000 0000 0000 0000 0000 0000 0000 0000 0000 0003 0003 c00c 0003 c024 0000 0000 0000 0000 0000 0000 0000 0000 0000 0000
0720040 0000 0000 0000 0000 0003 915c 0003 914c 0003 c05c 0003 c060 0003 01e0 0003 0a74 0003 257c 0000 0000 0000 00d6 0003 4db4
0720120 0000 4398 0003 a000 0000 0288 0003 c000 0300 0000 81c0 6000 0100 0000 9de3 bfa0 7fff fffc 0100 0000 9de3 bfa0 7fff fff9
0720200 0100 0001 9de3 bfa0 7fff fff6 0100 0002 9de3 bfa0 7fff fff3 0100 0003 9de3 bfa0 7fff fff0 0100 0004 9de3 bfa0 7fff ffed
0720260 0100 0005 9de3 bfa0 7fff ffea 0100 0006 9de3 bfa0 7fff ffe7 0100 0007 9de3 bfa0 7fff ffe4 0100 0008 9de3 bfa0 7fff ffe1
0720340 0100 0009 9de3 bfa0 7fff ffde 0100 000a 9de3 bfa0 7fff ffdb 0100 000b 9de3 bfa0 7fff ffd8 0100 000e 9de3 bfa0 7fff ffd5
0720420 0100 0013 9de3 bfa0 7fff ffd2 0100 0016 9de3 bfa0 7fff ffcf 0100 0019 9de3 bfa0 7fff ffcc 0100 0022 9de3 bfa0 7fff ffc9
0720500 0100 0023 9de3 bfa0 7fff ffc6 0100 0024 9de3 bfa0 7fff ffc3 0100 0025 9de3 bfa0 7fff ffc0 0100 0046 9de3 bfa0 7fff ffbd
0720560 0100 005f 9de3 bfa0 7fff ffba 0100 0060 9de3 bfa0 7fff ffb7 0100 0067 9de3 bfa0 7fff ffb4 0100 006c 9de3 bfa0 7fff ffb1
0720640 0100 007d 9de3 bfa0 7fff ffae 0100 007e 9de3 bfa0 7fff ffab 0100 007f 9de3 bfa0 7fff ffa8 0100 0080 9de3 bfa0 7fff ffa5
0720720 0100 0081 9de3 bfa0 7fff ffa2 0100 0082 9de3 bfa0 7fff ff9f 0100 0083 9de3 bfa0 7fff ff9c 0100 0084 9de3 bfa0 7fff ff99
0721000 0100 0085 9de3 bfa0 7fff ff96 0100 0086 9de3 bfa0 7fff ff93 0100 0087 9de3 bfa0 7fff ff90 0100 0088 9de3 bfa0 7fff ff8d
0721060 0100 0089 9de3 bfa0 7fff ff8a 0100 008a 9de3 bfa0 7fff ff87 0100 008b 9de3 bfa0 7fff ff84 0100 008c 9de3 bfa0 7fff ff81
0721140 0100 008d 9de3 bfa0 7fff ff7e 0100 008e 9de3 bfa0 7fff ff7b 0100 008f 9de3 bfa0 7fff ff78 0100 0090 9de3 bfa0 7fff ff75
0721220 0100 0091 9de3 bfa0 7fff ff72 0100 0092 9de3 bfa0 7fff ff6f 0100 0093 9de3 bfa0 7fff ff6c 0100 0094 9de3 bfa0 7fff ff69
0721300 0100 00a5 9de3 bfa0 7fff ff66 0100 00b4 9de3 bfa0 7fff ff63 0100 00b5 9de3 bfa0 7fff ff60 0100 00b6 0000 0000 0000 0000
0721360 0000 4494 0000 b738 0000 4b2c 0000 6a3c 0000 4e74 0003 21ac 0000 d8fc 0000 c6b8 0000 c2a4 0002 85d8 0002 c048 0002 ba48
0721440 0002 cc6c 0000 debc 0000 2bdc 0000 304c 0000 7f3c 0002 b394 0000 76a8 0002 a230 0002 aadc 0002 9974 0000 8ee4 0000 ada4
0721520 0002 794c 0000 0000 0000 44c0 0000 b7cc 0000 4b58 0000 6a7c 0000 4ea0 0003 21c4 0000 d928 0000 c6e4 0000 c2d0 0002 8604
0721600 0002 c088 0002 ba74 0002 cc98 0000 dee8 0000 2c08 0000 3078 0000 7f68 0002 b3c0 0000 76d4 0002 a25c 0002 ab08 0002 99a0
0721660 0000 8f10 0000 add0 0002 7978 0000 0000 0004 7f38 0004 8138 0004 7d30 0000 0000 7200 4361 6e6e 6f74 206f 7065 6e20 4465
0721740 7369 676e 2046 696c 6520 2225 7322 2e00 2573 2e65 7870 0077 0043 616e 6e6f 7420 6f70 656e 2066 696c 6520 2225 7322 2066
0722020 6f72 2043 6f64 6520 6578 7061 6e73 696f 6e2e 0025 732e 6d67 6900 7700 4361 6e6e 6f74 206f 7065 6e20 6669 6c65 2022 2573
```

```
0722100  2220 666f 7220 4d6f 6475 6c65 2044 6573 6372 6970 7469 6f6e 2e00 2573 2e76 636c 0077 0043 616e 6e6f 7420 6f70 656e 2066
0722160  696c 6520 2225 7322 2066 6f72 2063 6f6d 706f 6e65 6e74 2062 696e 6469 6e67 0025 7300 494f 5f4d 616e 3a20 4361 6e6e 6f74
0722240  2062 6163 6b20 7472 6163 6b20 2320 6375 7220 2564 2c20 7265 7120 2564 0045 4f46 2072 6561 6368 6564 2062 6566 6f72 6520
0722320  636f 6d70 6c65 7469 6f6e 206f 6620 635f 7079 0025 7300 0000 2d2d 0025 7300 2573 0a00 2573 0025 730a 0025 7300 2573 0025
0722400  7300 2573 0025 7300 2573 000a 0000 0000 0000 0000 0000 0000 0000 0000 0000 2d9c 0000 0000 0000 3260 0000 0000 0000 3230
0722460  0000 0000 0000 31fc 0000 0000 0000 31d4 0000 0000 0000 31ac 0000 0000 0000 3180 0000 0000 0000 3150 0000 0000 0000 3120
0722540  0000 0000 0000 0000 0003 c510 0000 0000 0000 0000 0000 0000 0000 30a8 0000 0000 0000 3260 0000 0000 0000 0000 0003 c56c
0722620  0003 dab0 0000 0000 2076 616c 7565 2069 7320 6f66 2074 7970 6520 0020 616e 6420 6973 2073 6574 2074 6f20 000a 000a 000a
0722700  0075 6e6b 6e6f 776e 2000 0a00 5354 5249 4e47 0049 4e54 4547 4552 0046 4c4f 4154 0042 6164 2061 7474 7269 6275 7465 2074
0722760  7970 6520 2573 0042 6164 2061 7474 7269 6275 7465 2074 7970 6520 2872 6571 7565 7374 6564 2900 0a00 4e4f 626a 6563 7400
0723040  0004 8388 0004 8390 2020 2020 2020 2020 2020 2020 2020 2020 2020 2020 2020 2020 2020 2020 2020 2020 2020 2020 2020 2020
0723120  2020 2020 2020 2020 2000 0000 0003 c628 0000 0000 0000 0000 0000 0000 0000 3544 0000 0000 0000 46dc 0000 0000 0000 46ac
0723200  0000 0000 0000 4678 0000 0000 0000 4650 0000 0000 0000 4628 0000 0000 0000 45fc 0000 0000 0000 45cc 0000 0000 0000 459c
0723260  0000 0000 0000 0000 0003 c660 0003 cacc 0003 c8c8 0003 c510 0004 26ac 0003 db28 0003 dba0 0000 0000 0000 0000 0000 0000
0723340  0000 4524 0000 0000 0000 46dc 0000 0000 0000 0000 0003 c6d4 0003 dab0 0000 0000 2000 2800 292c 206d 6f64 6520 6973 2000
0723420  736c 6963 6520 000a 0020 5872 6566 2074 6f20 7061 7261 6d65 7465 7220 000a 0020 0049 4e00 4f55 5400 494e 4f55 5400 4261
0723500  6420 7069 6e20 6469 7265 6374 696f 6e20 2825 7329 0a00 4261 6420 7061 7261 6d65 7465 7220 636c 6173 7300 4e6f 2046 6f72
0723560  6d61 6c20 5061 7261 6d65 7465 7220 666f 756e 6420 666f 7220 7468 6973 2041 6374 7561 6c20 7061 7261 6d65 7465 723a 2000
0723640  4163 7475 616c 2050 6172 616d 6574 6572 3a20 0000 006e 756c 6c00 2825 7329 006e 756c 6c00 2830 2074 6f20 2564 2900 6e75
0723720  6c6c 0028 2573 2900 2573 2573 203a 2025 7320 2573 2573 0020 006e 756c 6c00 2825 7329 006e 756c 6c00 2825 7329 0025 7325
0724000  7325 7300 2000 6e75 6c6c 0074 6f00 646f 776e 746f 006f 7065 6e00 4261 6420 7061 7261 6d65 7465 7220 636c 6173 7300 6e75
0724060  6c6c 006e 756c 6c00 5061 7261 6d65 7465 7220 2573 2063 616e 206e 6f74 2062 6520 6c65 6674 206f 7065 6e00 2573 2573 203a
0724140  2025 7320 2573 0025 7325 732e 2564 203a 2025 7320 2573 003b 0a00 5061 7261 6d65 7465 7220 2573 2063 616e 206e 6f74 2062
0724220  6520 6c65 6674 206f 7065 6e00 2573 2573 203d 3e20 2573 0025 7325 732e 2564 203d 3e20 2573 2825 6429 002c 0a00 0a00 4e4f
0724300  626a 6563 7400 0000 0000 0000 0000 0000 0000 0000 0000 4918 0000 0000 0000 4ce0 0000 0000 0000 4cb0 0000 0000 0000 4c7c
0724360  0000 0000 0000 4c54 0000 0000 0000 4c2c 0000 0000 0000 4c00 0000 0000 0000 4a54 0000 0000 0000 4ac0 0000 0000 0000 0000
0724440  0003 c8c8 0003 db28 0003 dba0 0000 0000 0000 0000 0000 0000 0000 4b88 0000 0000 0000 4ce0 0000 0000 0000 0000 0003 c92c
0724520  0003 dab0 0000 0000 4152 4348 4954 4543 5455 5245 0053 5542 5052 4f47 5241 4d00 4261 6420 656e 7469 7479 2074 7970 6520
0724600  2825 7329 0a00 4c61 6d65 206f 6620 6361 6c6c 696e 6720 626c 6f63 6b20 6973 2000 2c20 4669 6c65 206e 616d 6520 6973 2000
0724660  0a00 5468 6520 6361 6c6c 696e 6720 626c 6f63 6b20 6973 2061 6e20 002c 2000 6465 6669 6e65 6420 6174 206c 696e 6520 000a
0724740  7468 6520 626c 6f63 6b20 6973 2063 616c 6c65 6420 6174 206c 696e 6520 002c 2020 7468 6520 7072 6f63 6573 7320 626c 6f63
0725020  6b20 7374 6172 7420 6174 206c 696e 6520 000a 000a 004e 4f62 6a65 6374 0000 0000 0000 0000 0000 0000 0000 0000 0000 4ed0
0725100  0000 0000 0000 50ec 0000 0000 0000 50bc 0000 0000 0000 5088 0000 0000 0000 5060 0000 0000 0000 5038 0000 0000 0000 500c
0725160  0000 0000 0000 4fdc 0000 0000 0000 4fac 0000 0000 0000 0000 0003 ca30 0003 c510 0000 0000 0000 0000 0000 0000 0000 4f34
0725240  0000 0000 0000 50ec 0000 0000 0000 0000 0003 ca90 0003 dab0 2000 2000 0a00 4e4f 626a 6563 7400 0000 0000 0000 0000 0000
0725320  0000 0000 0000 0000 0000 54a8 0000 0000 0000 6cfc 0000 0000 0000 6ccc 0000 0000 0000 6c98 0000 0000 0000 6c70 0000 0000
0725400  0000 6c48 0000 0000 0000 6c1c 0000 0000 0000 56ac 0000 0000 0000 56e8 0000 0000 0000 0000 0003 cacc 0003 c8c8 0000 0000
0725460  0000 0000 0000 0000 0000 6aac 0000 0000 0000 6cfc 0000 0000 0000 6ccc 0000 0000 0000 6c98 0000 0000 0000 6c70 0000 0000
0725540  0000 6c48 0000 0000 0000 6c1c 0000 0000 0000 6bec 0000 0000 0000 6bbc 0000 0000 0000 0000 0003 cb2c 0003 c660 0003 c510
0725620  0004 26ac 0003 db28 0003 dba0 0000 0000 0000 0000 0000 0000 0000 6b44 0000 0000 0000 6cfc 0000 0000 0000 0000 0003 cb9c
0725700  0003 dab0 0000 0000 5052 4f43 4544 5552 4500 4655 4e43 5449 4f4e 0045 4e54 4954 5900 4261 6420 626c 6f63 6b20 7479 7065
0725760  2028 2573 290a 0020 0020 6973 206f 6620 7479 7065 2000 0a00 4163 7475 616c 2050 6172 616d 6574 6572 7320 6172 653a 200a
0726040  0050 6172 616d 6574 6572 733a 2000 0a46 6f72 6d61 6c20 5061 7261 6d65 7465 7273 2061 7265 3a20 0a0a 0050 6172 616d 6574
0726120  6572 733a 2000 0a52 6573 6f6c 7665 6420 5061 7261 6d65 7465 7273 2061 7265 3a20 0a0a 0050 6172 616d 6574 6572 733a 2000
0726200  0a50 6172 656e 7420 6973 3a20 000a 000a 4174 7472 6962 7574 6573 2061 7265 3a20 000a 4174 7472 6962 7574 6520 000a 0a0a
0726260  006c 7369 5f6d 6f64 756c 655f 6765 6e65 7261 746f 7200 6c73 695f 6d6f 6475 6c65 5f67 656e 6572 6174 6f72 006c 7369 5f6d
0726340  6f64 756c 655f 7479 7065 004d 6f64 756c 6520 6074 7970 6527 2069 7320 756e 6b6e 6f77 6e20 2d20 7665 7269 6679 2055 4441
0726420  006c 7369 5f6d 6f64 756c 655f 7375 625f 7479 7065 004d 6f64 756c 6520 6073 7562 5f74 7970 6527 2069 7320 756e 6b6e 6f77
0726500  6e20 2420 7665 7269 6679 2055 4441 0020 2020 434f 4d50 4f4e 454e 5420 2573 0a00 2573 0025 7300 2020 2020 2020 504f 5254
0726560  2028 0a00 2573 0025 7300 3b0a 0025 7300 293b 0a00 2573 0020 2020 454e 4420 434f 4d50 4f4e 454e 543b 0a00 2020 2025 733a
0726640  2000 2573 0025 7320 504f 5254 204d 4150 2028 0a00 2573 0020 2020 2025 7320 3d3e 2000 2573 0025 7300 2573 002c 0a00
0726720  2573 0029 3b0a 0025 735f 5525 645f 2573 5f25 7300 5525 6400 4e75 6c6c 2058 5245 4620 7061 7261 6d65 7465 7220 706f 696e
0727000  7465 7221 006c 7369 5f63 6f6d 705f 6c65 6e67 7468 0042 6164 2070 696e 206e 616d 6520 2825 7329 2069 6e20 5544 4120 2825
0727060  7329 006c 7369 5f63 6f6d 705f 6c65 6e67 7468 0020 2020 6765 6e65 7261 7469 6e67 2020 6d6f 6475 6c65 2064 6573 6372 6970
0727140  746f 7220 666f 7220 2225 7322 2028 6c69 6e65 2025 6429 202e 2e2e 0a00 6563 686f 2047 656e 6572 6174 696e 6720 626c 6f63
```

0727220 6b20 2725 7327 2076 6961 2027 2573 2720 2e2e 2e0a 0025 7300 2573 203c 3c20 454e 444d 4745 4e20 3e3e 2120 2573 2e4d 476c
0727300 6f67 0a00 2573 0025 7300 2573 0071 0a45 4e44 4d47 454e 0a65 6368 6f20 2020 2e2e 2e20 636f 6d70 6c65 7465 642e 0a00 2573
0727360 000a 0a2d 2d0a 2d2d 0a00 454e 5449 5459 2025 7320 4953 0a00 2573 0025 7300 2020 2020 2020 2050 4f52 5420 280a 0025 7300
0727440 2573 003b 0a00 2573 0029 3b0a 0045 4e44 2025 733b 0a0a 0025 7300 4152 4348 4954 4543 5455 5245 2073 7472 6374 726c 5f76
0727520 6965 7720 4f46 2025 730a 4953 0a00 2573 0020 2020 434f 4d50 4f4e 454e 5420 2573 5f55 300a 0025 7300 2573 0020 2020 2020
0727600 2050 4f52 5420 280a 0025 7300 2573 003b 0a00 2573 0029 3b0a 454e 4420 434f 4d50 4f4e 454e 543b 0a0a 0025 7300 4245 4749
0727660 4e0a 0020 2055 3020 3a20 2573 5f55 300a 0025 7300 2573 0020 2020 2020 2020 2020 2020 2020 504f 5254 204d 4150 2028 0a00
0727740 2573 0025 7300 2c0a 0025 7300 293b 0a00 2573 0045 4e44 2073 7472 6374 726c 5f76 6965 773b 0a0a 2d2d 0a2d 2d0a 0020 0020
0730020 000a 004e 4f62 6a65 6374 0000 0000 0000 0000 0000 0000 0000 0000 0000 0000 0000 0000 7704 0000 0000 0000 79dc 0000 0000
0730100 0000 79ac 0000 0000 0000 7979 0000 0000 0000 7950 0000 0000 0000 7928 0000 0000 0000 78fc 0000 0000 0000 7264 0000 0000
0730160 0000 72e0 0000 0000 0000 0000 0003 d024 0003 cacc 0003 c8c8 0004 26ac 0003 db28 0003 dba0 0000 0000 0000 0000 0000 0000
0730240 0000 7884 0000 0000 0000 79dc 0000 0000 0000 0000 0003 d094 0003 dab0 0000 0000 2070 726f 6365 7373 696e 6720 6361 6c6c
0730320 7320 696e 2065 6e74 6974 7920 2225 7322 202e 2e2e 0a00 6973 0025 7300 6973 0a00 2573 002d 2d20 6c73 695f 6c6f 6769 6320
0730400 7370 6563 6966 6963 2063 6f6d 706f 6e65 6e74 2064 6563 6c61 7261 7469 6f6e 0a00 2573 003b 0025 7300 2d2d 206c 7369 5f6c
0730460 6f67 6963 2073 7065 6369 6669 6320 636f 6d70 6f6e 656e 7420 696e 7374 616e 6365 0a00 2573 0020 696e 2066 696c 6520 2200
0730540 222c 0077 6974 6820 6172 6368 6974 6563 7475 7265 2022 0022 206f 6620 7479 7065 2022 0022 0a00 4974 2073 7461 7274 7320
0730620 6174 206c 696e 6520 2200 2220 6961 7320 2200 2220 7175 616c 6966 6965 6420 7375 622d 626c 6f63 6b73 2c20 616e 6420 2200
0730700 2220 6e6f 6e2d 7175 616c 6966 6965 6420 7375 6270 726f 6772 616d 2063 616c 6c73 0a00 5175 616c 6966 6965 643a 2000 4e6f
0730760 6e2d 5175 616c 6966 6965 643a 2000 0a00 4e4f 626a 6563 7400 0000 0000 0000 0000 0000 0000 0000 7cc4 0000 0000 0000 8190
0731040 0000 0000 0000 8160 0000 0000 0000 812c 0000 0000 0000 8104 0000 0000 0000 80dc 0000 0000 0000 80b0 0000 0000 0000 8080
0731120 0000 0000 0000 8050 0000 0000 0000 0000 0003 d208 0003 d024 0003 cacc 0003 c8c8 0004 26ac 0003 db28 0003 dba0 0000 0000
0731200 0000 0000 0000 0000 0000 7fd8 0000 0000 0000 8190 0000 0000 0000 0000 0003 d27c 0003 dab0 0000 0000 4669 6c65 556e 6974
0731260 2022 0022 2068 6173 2022 0022 2044 6573 6967 6e55 6e69 7473 0a00 456e 7469 7479 4c69 7374 3a20 0025 7300 2321 202f 6269
0731340 6e2f 6373 6820 2366 620a 000a 5072 6f63 6573 7369 6e67 204d 6f64 756c 6520 4765 6e65 7261 746f 7220 6361 6c6c 7320 696e
0731420 2066 696c 6520 2225 7322 202e 2e0a 000a 004e 4f62 6a65 6374 0000 0000 0000 0000 0000 0000 0000 0000 0000 0000 0000 8474
0731500 0000 0000 0000 9138 0000 0000 0000 9108 0000 0000 0000 90d4 0000 0000 0000 90ac 0000 0000 0000 9084 0000 0000 0000 9058
0731560 0000 0000 0000 9028 0000 0000 0000 8ff8 0000 0000 0000 0000 0003 d330 0003 d208 0003 d024 0003 cacc 0003 c8c8 0004 26ac
0731640 0003 db28 0003 dba0 0000 0000 0000 0000 0000 0000 0000 8f80 0000 0000 0000 9138 0000 0000 0000 0000 0003 d3a8 0003 dab0
0731720 0a00 426c 6f63 6b20 0044 6573 6967 6e20 556e 6974 7320 0046 696c 6520 556e 6974 733a 2000 0a00 4e4f 626a 6563 7400 0000
0732000 2448 6561 6465 723a 206c 7369 6e68 7368 2e68 2c76 2031 302e 3120 3839 2f30 382f 3135 2031 323a 3139 3a33 3920 636c 3132
0732060 3021 7469 6d20 4578 7020 2400 2448 6561 6465 723a 206c 7369 6770 616c 2e68 2c76 2031 302e 3020 3839 2f30 352f 3039 2031
0732140 353a 3231 3a34 3320 636c 3132 3021 7369 6d6c 6962 2045 7870 2024 0000 2448 6561 6465 723a 206d 612e 682c 7620 3130 2e30
0732220 2e30 2e30 2038 392f 3036 2f32 3720 3136 3a30 363a 3138 206f 7069 756d 2174 6f6f 6c6c 6962 2054 6f6f 6c6c 6962 2024 0000
0732300 0000 0000 0000 0000 0000 0000 0000 0000 0000 0000 0000 0000 0000 0000 0000 0000 0003 d330 0003 d208 0003 d024 0003 cacc
0732360 0003 c8c8 0000 0000 0000 0000 0000 0000 0000 ae40 0000 0000 0000 b090 0000 0000 0000 b060 0000 0000 0000 b02c 0000 0000
0732440 0000 b004 0000 0000 0000 afdc 0000 0000 0000 afb0 0000 0000 0000 af80 0000 0000 0000 af50 0000 0000 0000 0000 0003 d4f4
0732520 0003 c660 0003 c510 0004 26ac 0003 db28 0003 dba0 0000 0000 0000 0000 0000 0000 0000 aed8 0000 0000 0000 b090 0000 0000
0732600 0000 0000 0003 d564 0003 dab0 0000 0000 7200 4361 6e20 6e6f 7420 6f70 656e 2062 6c6f 636b 2066 696c 6520 2825 7329 0052
0732660 6561 6469 6e67 2062 6c6f 636b 2066 696c 6520 2225 7322 2e2e 2e0a 0000 3b00 3a00 3d00 2c00 2200 2800 2900 7b00 7d00 5355
0732740 425f 424c 4f43 4b00 5459 5045 0041 5454 5249 4255 5445 5300 4154 5200 5641 4c55 4500 4341 4c4c 494e 475f 454e 5449 5459
0733020 0045 4e54 4954 5900 4152 4348 4954 4543 5455 5245 0045 4e54 4954 595f 5459 5045 0046 494c 4500 4152 4348 5f4c 494e 4500
0733100 4341 4c4c 5f4c 494e 4500 5052 4f43 4553 535f 4c49 4e45 0050 4152 414d 4554 4552 0043 4f4e 5354 5241 494e 0044 4952 4543
0733160 5449 4f4e 0046 4f52 4d41 4c00 4143 5455 414c 0052 4553 4f4c 5645 4400 464f 524d 414c 5f50 4152 414d 0053 4c49 4345 0022
0733240 0020 2020 2564 206c 696e 6573 2077 6572 6520 7265 6164 2e0a 0a00 4c69 6e65 2025 643a 2053 796e 7461 7820 6572 726f 7220
0733320 696e 2062 6c6f 636b 2066 696c 6520 2725 7327 0020 0020 000a 004e 4f62 6a65 6374 0000 0000 0000 0000 0003 d808 0003 d810
0733400 0003 d81d 0003 d828 0003 d830 0003 d837 0003 d840 0003 d84a 0003 d852 0003 d859 0003 d861 0003 d867 0003 d86f 0003 d872
0733460 0003 d876 0003 d87c 0003 d884 0003 d887 0003 d98b 0003 d891 0003 d899 0003 d8a0 0003 d8a7 0004 8398 0000 0000 0003 d330
0733540 0003 d208 0003 d024 0003 cacc 0003 c8c8 0000 0000 0000 0000 0000 0000 0000 b83c 0000 0000 0000 badc 0000 0000 0000 ba5c
0733620 0000 0000 0000 ba28 0000 0000 0000 ba00 0000 0000 0000 b9d8 0000 0000 0000 b9ac 0000 0000 0000 b97c 0000 0000 0000 b94c
0733700 0000 0000 0000 0000 0003 d770 0003 c660 0003 c510 0004 26ac 0003 db28 0003 dba0 0000 0000 0000 0000 0000 0000 0000 b8d4
0733760 0000 0000 0000 ba8c 0000 0000 0000 0000 0003 d7e0 0003 dab0 556e 6b6e 6f77 6e00 4152 4348 4954 4543 5455 5245 0053 5542
0734040 5052 4f47 5241 4d00 556e 6b6e 6f77 6e00 454e 5449 5459 0046 554e 4354 494f 4e00 5052 4f43 4544 5552 4500 556e 6b6e 6f77
0734120 6e00 5354 5249 4e47 0049 4e54 4547 4552 0046 4c4f 4154 0055 6e6b 6e6f 776e 0049 4e00 4f55 5400 494e 4f55 5400 756e 6b6e
0734200 6f77 6e00 696e 006f 7574 0069 6e6f 7574 0055 6e6b 6e6f 776e 0046 6f72 6d61 6c00 4163 7475 616c 0052 6573 6f6c 7665 6400
0734260 5573 6167 653a 2020 5645 5820 3c62 6c6f 636b 5f66 696c 653e 0a00 434d 4f53 3130 4b00 2000 2000 0a00 4e4f 626a 6563 7400

```
0734340  7965 7300 6e6f 0000 0003 d8e0 0003 d8e4 2448 6561 6465 723a 206c 7369 6e68 7368 2e68 2c76 2031 302e 3120 3839 2f30 382f
0734420  3135 2031 323a 3139 3a33 3920 636c 3132 3021 7469 6d20 4578 7020 2400 2448 6561 6465 723a 206c 7369 6770 616c 2e68 2c76
0734500  2031 302e 3020 3839 2f30 352f 3039 2031 353a 3231 3a34 3320 636c 3132 3021 7369 6d6c 6962 2045 7870 2024 0000 2448 6561
0734560  6465 723a 206d 612e 682c 7620 3130 2e30 2e30 2e30 2038 392f 3036 2f32 3720 3136 3a30 363a 3138 206f 7069 756d 2174 6f6f
0734640  6c6c 6962 2054 6f6f 6c6c 6962 2024 0000 2020 2448 6561 6465 723a 206c 7369 6c65 782e 682c 7620 3130 2e30 2038 392f 3035
0734720  2f30 3920 3135 3a32 343a 3234 2063 6c78 3132 3021 7369 6d6c 6962 2045 7870 2024 2000 0000 0000 0000 2a2a 2a20 2563 2025
0735000  3564 203a 2025 730a 0000 0000 2000 002d 5f24 257e 0020 0020 0064 6f6e 2774 206b 6e6f 7721 0000 0000 0000 0000 0000 0000
0735060  0000 0000 0000 c440 0000 0000 0000 c4a0 0000 0000 0000 c410 0000 0000 0000 c3dc 0000 0000 0000 c3b4 0000 0000 0000 c38c
0735140  0000 0000 0000 c360 0000 0000 0000 c330 0000 0000 0000 c300 0000 0000 0000 0000 0003 da28 0003 dab0 4e4f 626a 6563 743a
0735220  3a4e 4f62 6a65 6374 004e 4f62 6a65 6374 3a3a 7365 744e 616d 6500 203a 2000 0a00 0000 0000 0000 0000 0000 0000 0000 c680
0735300  0000 0000 0000 c714 0000 0000 0000 0000 0003 dab0 0000 0000 0a2a 2a2a 2045 5252 4f52 203a 2046 4149 4c20 544f 2041 4c4c
0735360  4f43 4154 4520 4d45 4d4f 5259 2046 4f52 2025 732c 2056 414c 5545 203d 2025 730a 004d 6573 7361 6765 2066 726f 6d20 2573
0735440  200a 0000 0000 0000 0000 0000 0000 0000 0000 0000 0000 d1e8 0000 0000 0000 cf64 0000 0000 0000 d054 0000 0000 0000 d10c
0735520  0000 0000 0000 cc44 0000 0000 0000 0000 0003 db28 0003 dba0 0000 0000 0000 0000 0000 0000 0000 d958 0000 0000 0000 d9d0
0735600  0000 0000 0000 0000 0003 db68 0003 dab0 3a20 0a00 0a00 4e4f 626a 6563 7400 0000 0000 0000 0000 0000 0000 0000 0000 ddec
0735660  0000 0000 0000 dfa8 0000 0000 0000 df78 0000 0000 0000 df48 0000 0000 0000 df18 0000 0000 0000 0000 0003 dba0 0000 0000
0735740  0000 0000 0000 0000 0000 dfd8 0000 0000 0000 e050 0000 0000 0000 0000 0003 dbdc 0003 dab0 0000 0000 0a2a 2a2a 2045 5252
0736020  4f52 203a 2046 4149 4c20 544f 2041 4c4c 4f43 4154 4520 4d45 4d4f 5259 2046 4f52 2025 732c 2056 414c 5545 203d 2025 730a
0736100  003a 200a 000a 004e 4f62 6a65 6374 0000 2020 2448 6561 6465 723a 206c 7369 696f 2e63 2c76 2031 302e 3420 3839 2f30 362f
0736160  3239 2031 363a 3032 3a33 3220 636c 3834 2170 6766 2045 7870 2024 2000 2448 6561 6465 723a 206c 7369 7379 732e 682c 7620
0736240  3130 2e30 2038 392f 3035 2f30 3920 3135 3a34 303a 3135 2063 6c31 3230 2173 696d 6c69 6220 4578 7020 2400 0000 2448 6561
0736320  6465 723a 206c 7369 6465 662e 682c 7620 3130 2e31 2038 392f 3038 2f32 3220 3139 3a31 343a 3437 2063 6c31 3230 2163 686f
0736400  6e67 2045 7870 2024 0000 0000 2448 6561 6465 723a 206c 7369 6c73 742e 682c 7620 3130 2e30 2038 392f 3035 2f30 3920 3135
0736460  3a32 353a 3531 2063 6c78 3132 3021 7369 6d6c 6962 2045 7870 2024 0000 2448 6561 6465 723a 206c 7369 6770 616c 2e68 2c76
0736540  2031 302e 3020 3839 2f30 352f 3039 2031 353a 3231 3a34 3320 636c 3132 3021 7369 6d6c 6962 2045 7870 2024 0000 2448 6561
0736620  6465 723a 206d 612e 682c 7620 3130 2e31 2038 392f 3031 2f31 3220 3135 3a32 393a 3034 2063 6c78 3131 3121 7469 6d20 546f
0736700  6f6c 6c69 6220 2400 2024 4865 6164 6572 3a20 6c69 6264 6566 2e68 2c76 2031 302e 3020 3839 2f30 352f 3039 2031 353a 3034
0736760  3a35 3920 636c 3132 3021 7369 6d6c 6962 2045 7870 2024 0000 2020 2448 6561 6465 723a 206c 7369 7472 6c2e 682c 7620 3130
0737040  2e30 2038 392f 3035 2f30 3920 3135 3a34 313a 3536 2063 6c31 3230 2173 696d 6c69 6220 4578 7020 2420 0000 0000 0000 0000
0737120  0000 0000 0000 0000 0001 0000 0100 0000 0000 0000 0100 0000 0100 0000 0000 0000 7fff ffff 0000 0000 0000 0000 0000 0032
0737200  0000 0000 0000 0000 0000 0000 0000 0032 ffff fffe 0000 0000 0000 0000 0100 0000 0000 0000 0000 0000 0000 0000 0000 0000
0737260  0003 dec8 0000 001a 0035 0000 0000 0000 0000 0000 0000 0000 0077 6600 2020 004c 5349 204c 4f47 4943 2043 4f52 504f 5241
0737340  5449 4f4e 2028 434f 5059 5249 4748 5420 3139 3833 2c20 3139 3834 2c20 3139 3835 2c20 3139 3836 2c20 3139 3837 2900 5041
0737420  4745 3a20 004e 4554 3a20 0050 4147 453a 2000 4e45 543a 2000 2573 2534 642e 2020 0025 7300 2573 2573 0025 7325 3464 2e20
0737500  2000 2573 2573 0025 7300 2573 2573 0020 286c 6973 7469 6e67 2066 696c 6520 6e6f 7420 6f70 656e 290a 0025 7320 2020 2020
0737560  2025 730a 0025 7325 7300 2573 2573 0025 7325 7300 2028 6c69 7374 696e 6720 6669 6c65 206e 6f74 206f 7065 6e29 0a00 2a2a
0737640  2a20 2563 2025 3364 203a 2000 2a2a 2a20 2563 2025 3364 203a 2000 0a00 0a2a 2a2a 2025 6320 2533 6420 3a20 000a 000a 2a2a
0737720  2a20 2563 2025 3364 203a 2000 2028 6c69 7374 696e 6720 6669 6c65 206e 6f74 206f 7065 6e29 0a00 2a2a 2a20 2563 2025 3364
0740000  203a 2000 2a2a 2a20 5720 2030 203a 2054 6f6f 206d 616e 7920 6d65 7373 6167 6573 2e00 434f 4c55 4d4e 3a20 2564 000a 2573
0740060  0a00 2573 2564 0a25 730a 000a 0a25 730a 000a 2573 2000 0a25 7300 2525 2564 7325 2573 2000 2000 2536 6400 2536 6400 2536
0740140  6400 6469 6167 6e6f 7374 6963 7300 7761 726e 696e 6773 0000 6469 6167 6e6f 7374 6963 7300 6572 726f 7273 0000 6469 6167
0740220  6e6f 7374 6963 7300 7365 7269 6f75 7320 6572 726f 7273 0000 7761 726e 696e 6773 3a20 2564 2c20 6572 726f 7273 3a20 2564
0740300  2c20 7365 7269 6f75 7320 6572 726f 7273 3a20 2564 0a00 7761 726e 696e 6773 3a20 2564 2c20 6572 726f 7273 3a20 2564 2c20
0740360  7365 7269 6f75 7320 6572 726f 7273 3a20 2564 0a00 0a0a 002a 2a2a 206e 756d 6265 7220 6f66 2077 6172 6e69 6e67 7320 3a20
0740440  2533 640a 002a 2a2a 206e 756d 6265 7220 6f66 2065 7272 6f72 7320 3a20 2533 640a 002a 2a2a 206e 756d 6265 7220 6f66 2073
0740520  6572 696f 7573 2065 7272 6f72 7320 3a20 2533 640a 000a 0a2a 2a2a 206e 756d 6265 7220 6f66 2069 6e66 6f72 6d61 7469 6f6e
0740600  616c 206d 6573 7361 6765 7320 3a20 2533 640a 0054 6f74 616c 0074 726d 0077 6600 7472 6d00 7764 006c 7374 003e 3e3e 2a2a
0740660  2a20 4572 726f 7220 7772 6974 696e 6720 6175 6469 7420 7472 6169 6c20 666f 7220 6c69 7374 696e 6720 6669 6c65 202a 2a2a
0740740  3c3c 3c0a 0074 726d 0077 6600 7472 6d00 7764 006c 7374 003e 3e3e 2a2a 2a20 4572 726f 7220 7772 6974 696e 6720 6175 6469
0741020  7420 7472 6169 6c20 666f 7220 6c69 7374 696e 6720 6669 6c65 202a 2a2a 3c3c 3c0a 0054 6f74 616c 0043 616e 2774 2069 6e69
0741100  7469 616c 6973 6520 6175 6469 745f 7472 6169 6c2e 0a00 4c49 5354 004c 5354 002d 4c00 5741 524e 494e 4753 0045 5252 5300
0741160  5345 5252 5300 5354 4154 5300 5354 4154 4953 5449 4353 002d 5300 5100 5052 4f47 5645 5200 5348 4f52 544c 4953 5400 4252
0741240  4f57 5345 0046 696c 6520 6e61 6d65 206e 6f74 2073 7065 6369 6669 6564 2e0a 0043 616e 2774 206f 7065 6e20 6c69 7374 696e
0741320  6720 6669 6c65 3a20 2573 0a00 6c73 7400 7700 4361 6e27 7420 6f70 656e 206c 6973 7469 6e67 2066 696c 653a 2025 730a 006c
0741400  7374 0025 7325 7300 4c44 5320 5265 6c65 6173 6520 3130 2e30 0a00 2863 2920 436f 7079 7269 6768 7420 3139 3833 2d31 3938
```

```
0741460  3920 4c53 4920 4c6f 6769 6320 436f 7270 6f72 6174 696f 6e2e 2020 0041 6c6c 2072 6967 6874 7320 7265 7365 7276 6564 2e0a
0741540  0050 726f 6772 616d 2027 2573 2720 5665 7273 696f 6e20 2573 2025 732f 252e 3273 2e0a 0000 0000 556e 6b6e 6f77 6e20 4252
0741620  4f57 5345 206f 7074 696f 6e20 2725 6327 2e0a 000a 4272 6f77 7365 206c 6973 7469 6e67 2066 696c 6520 2573 3f20 0050 524f
0741700  4752 414d 2e4c 5354 464e 414d 4500 7700 6d6f 7265 2025 730a 0065 6368 6f20 2250 726f 6772 616d 2074 6572 6d69 6e61 7465
0741760  6420 6162 6e6f 726d 616c 6c79 2e22 0a00 726d 2050 524f 4752 414d 2e4c 5354 464e 414d 450a 0063 7368 202d 6620 5052 4f47
0742040  5241 4d2e 4c53 5446 4e41 4d45 0061 7267 7564 656e 7400 0044 656d 6f72 7920 6578 6861 7573 7465 642e 2020 2564 204b 2062
0742120  7974 6573 2075 7365 642c 2025 6420 4b20 6279 7465 7320 616c 6c6f 6361 7465 642e 0a00 2573 2573 0025 7325 7300 2573 2573
0742200  0020 286c 6973 7469 6e67 2066 696c 6520 6e6f 7420 6f70 656e 290a 0000 0000 0000 2020 2448 6561 6465 723a 206c 7369 6f70
0742260  746e 2e63 2c76 2031 302e 3120 3839 2f30 362f 3238 2031 383a 3330 3a33 3720 636c 3834 2170 6766 2045 7870 2024 2000 0000
0742340  2448 6561 6465 723a 206c 7369 6465 662e 682c 7620 3130 2e31 2038 392f 3038 2f32 3220 3139 3a31 343a 3437 2063 6c31 3230
0742420  2163 686f 6e67 2045 7870 2024 0000 0000 2448 6561 6465 723a 206c 7369 7379 732e 682c 7620 3130 2e30 2038 392f 3035 2f30
0742500  3920 3135 3a34 303a 3135 2063 6c31 3230 2173 696d 6c69 6220 4578 7020 2400 0000 2448 6561 6465 723a 206c 7369 6770 616c
0742560  2e68 2c76 2031 302e 3020 3839 2f30 352f 3039 2031 353a 3231 3a34 3320 636c 3132 3021 7369 6d6c 6962 2045 7870 2024 0000
0742640  2448 6561 6465 723a 206d 612e 682c 7620 3130 2e31 2038 392f 3031 2f31 3220 3135 3a32 393a 3034 2063 6c78 3131 3121 7469
0742720  6d20 546f 6f6c 6c69 6220 2400 0000 0000 4f70 7469 6f6e 2065 7272 6f72 3a20 2573 2e0a 004e 4f00 546f 6f20 6d61 6e79 2070
0743000  6f73 6974 696f 6e61 6c20 6172 6775 6d65 6e74 7320 6465 6669 6e65 6400 0028 2564 2900 4172 6775 6d65 6e74 2025 7320 6967
0743060  6e6f 7265 640a 0028 6967 6e6f 7265 6429 002d 2100 546f 6f20 6d61 6e79 206f 7074 696f 6e73 2073 7065 6369 6669 6564 0054
0743140  6f6f 206d 616e 7920 706f 7369 7469 6f6e 616c 2061 7267 756d 656e 7473 0028 6465 6661 756c 7429 0049 6e76 616c 6964 206f
0743220  7074 696f 6e3a 2025 730a 0028 696e 7661 6c69 6429 0028 7370 6563 6966 6965 6429 0028 7370 6563 6966 6965 6429 0028 6e75
0743300  6c6c 2900 0000 0000 2020 2448 6561 6465 723a 206c 7369 7469 6465 2e63 2c76 2031 302e 3020 3839 2f30 352f 3039 2031 353a
0743360  3430 3a35 3020 636c 7831 3230 2173 696d 6c69 6220 4578 7020 2420 0000 2448 6561 6465 723a 206c 7369 6465 662e 682c 7620
0743440  3130 2e31 2038 392f 3038 2f32 3220 3139 3a31 343a 3437 2063 6c31 3230 2163 686f 6e67 2045 7870 2024 0000 0000 2448 6561
0743520  6465 723a 206c 7369 6770 616c 2e68 2c76 2031 302e 3020 3839 2f30 352f 3039 2031 353a 3231 3a34 3320 636c 3132 3021 7369
0743600  6d6c 6962 2045 7870 2024 0000 2448 6561 6465 723a 206d 612e 682c 7620 3130 2e31 2038 392f 3031 2f31 3220 3135 3a32 393a
0743660  3034 2063 6c78 3131 3121 7469 6d20 546f 6f6c 6c69 6220 2400 0000 0000 0000 0000 408f 4000 0000 0000 0000 0000 0000 0000
0743740  4059 0000 0000 0000 408f 4000 0000 0000 0000 0000 0000 0000 4059 0000 0000 0000 0000 0000 0000 0000 408f 4000 0000 0000
0744020  4059 0000 0000 0000 2532 302e 3230 7320 2020 2063 7075 2020 2020 7265 616c 2020 7574 696c 697a 6174 696f 6e20 2073 746f
0744100  7261 6765 2028 4b42 290a 0020 0025 3230 2e32 3073 2020 2020 2020 2020 2020 2020 2020 2020 2020 2020 2020 2020 2020 2020
0744160  2020 616c 6c6f 6320 2020 7573 6564 0a0a 0020 0025 2d32 302e 3230 733a 2537 2e33 662f 2537 2e33 6620 2020 2825 352e 3166
0744240  2525 2920 2025 362e 3664 2020 2536 2e36 640a 0025 372e 3366 0025 2d32 302e 3230 733a 2537 2e33 662f 2537 2e33 6620 2020
0744320  2825 352e 3166 2525 2920 2025 362e 3664 2020 2536 2e36 640a 0025 372e 3366 000a 252d 3230 2e32 3073 3a25 372e 3366 2f25
0744400  372e 3366 2020 2028 2535 2e31 6625 2529 2020 2536 2e36 6420 2025 362e 3664 0a00 2020 2448 6561 6465 723a 206c 7369 7472
0744460  6c2e 632c 7620 3130 2e30 2038 392f 3035 2f30 3920 3135 3a34 313a 3233 2063 6c78 3132 3021 7369 6d6c 6962 2045 7870 2024
0744540  2000 0000 2448 6561 6465 723a 206c 7369 7379 732e 682c 7620 3130 2e30 2038 392f 3035 2f30 3920 3135 3a34 303a 3135 2063
0744620  6c31 3230 2173 696d 6c69 6220 4578 7020 2400 0000 2448 6561 6465 723a 206c 7369 6770 616c 2e68 2c76 2031 302e 3020 3839
0744700  2f30 352f 3039 2031 353a 3231 3a34 3320 636c 3132 3021 7369 6d6c 6962 2045 7870 2024 0000 2448 6561 6465 723a 206d 612e
0744760  682c 7620 3130 2e31 2038 392f 3031 2f31 3220 3135 3a32 393a 3034 2063 6c78 3131 3121 7469 6d20 546f 6f6c 6c69 6220 2400
0745040  2024 4865 6164 6572 3a20 6c69 6264 6566 2e68 2c76 2031 302e 3020 3839 2f30 352f 3039 2031 353a 3034 3a35 3920 636c 3132
0745120  3021 7369 6d6c 6962 2045 7870 2024 0000 2020 2448 6561 6465 723a 206c 7369 7472 6c2e 682c 7620 3130 2e30 2038 392f 3035
0745200  2f30 3920 3135 3a34 313a 3536 2063 6c31 3230 2173 696d 6c69 6220 4578 7020 2420 0000 0000 0000 0000 5761 726e 696e 673a
0745260  2066 666c 6f70 656e 2069 7320 676f 696e 6720 6177 6179 2073 6f6f 6e0a 0020 0072 6200 7262 0041 7564 6974 2074 7261 696c
0745340  3a20 696e 6669 6e69 7465 2072 6563 7572 7369 6f6e 2069 6e20 6669 6c65 6869 7374 2e0a 0041 7564 6974 2074 7261 696c 3a20
0745420  696e 6669 6e69 7465 2072 6563 7572 7369 6f6e 2069 6e20 6d65 6d62 6869 7374 2e0a 0000 0030 3030 3030 3030 3030 3030 3000
0745500  2441 7564 6974 5f74 7261 696c 3a00 2441 7564 6974 5f74 7261 696c 3a00 2441 7564 6974 5f74 7261 696c 3a00 2d2d 2d20 4175
0745560  6469 7420 5472 6169 6c20 2d2d 2d00 000a 0a50 726f 6772 616d 206e 616d 653a 2025 7320 0a50 726f 6772 616d 2076 6572 7369
0745640  6f6e 3a20 2573 0a0a 004f 7074 696f 6e73 2061 6e64 2070 6172 616d 6574 6572 7320 2867 726f 7570 3a20 6e61 6d65 3d76 616c
0745720  7565 2075 6e69 7429 3a0a 0a00 252d 3230 2e32 3073 3a20 252d 3230 2e32 3073 3d20 252d 3230 2e32 3073 2025 2d73 0a00 0a46
0746000  696c 6573 2028 6c6f 6769 6361 6c2c 2072 2f77 2c20 7265 7664 6174 652c 2063 6865 636b 7375 6d2c 206e 616d 6529 3a0a 0a00
0746060  4649 4c45 3a20 252d 382e 3873 2025 6320 252d 3230 2e32 3073 2025 2d31 322e 3132 7320 252d 730a 000a 4c69 6272 6172 6965
0746140  7320 2872 6576 6973 696f 6e2c 206e 616d 6529 3a0a 0a00 4c49 4252 4152 593a 2020 7265 7669 7369 6f6e 3a20 252d 3230 2e32
0746220  3073 206e 616d 653a 2025 2d73 0a0c 0a0a 2d2d 2d20 456e 6420 6f66 2041 7564 6974 2054 7261 696c 202d 2d2d 0a00 4441 5445
0746300  2055 4e4b 4e4f 574e 0054 2b00 7200 542b 0077 0025 382e 3864 0072 6200 7200 2e00 7262 002e 0072 0077 0025 6400 7200 2b52
0746360  4556 4c45 5645 4c00 7700 002b 5245 564c 4556 454c 0072 0054 2b00 542b 0072 0072 0000 0000 0000 0000 2020 2448 6561 6465
0746440  723a 206c 7369 7379 732e 632c 7620 3130 2e30 2038 392f 3035 2f30 3920 3135 3a33 393a 3435 2063 6c78 3132 3021 7369 6d6c
0746520  6962 2045 7870 2024 2000 0000 2448 6561 6465 723a 206c 7369 7379 732e 682c 7620 3130 2e30 2038 392f 3035 2f30 3920 3135
```

```
0746600 3a34 303a 3135 2063 6c31 3230 2173 696d 6c69 6220 4578 7020 2400 0000 2448 6561 6465 723a 206c 7369 6770 616c 2e68 2c76
0746660 2031 302e 3020 3839 2f30 352f 3039 2031 353a 3231 3a34 3320 636c 3132 3021 7369 6d6c 6962 2045 7870 2024 0000 2448 6561
0746740 6465 723a 206d 612e 682c 7620 3130 2e31 2038 392f 3031 2f31 3220 3135 3a32 393a 3034 2063 6c78 3131 3121 7469 6d20 546f
0747020 6f6c 6c69 6220 2400 0000 0000 0000 0000 2532 2e32 6425 322e 3264 2532 2e32 6425 322e 3264 2532 2e32 6425 322e 3264 0025
0747100 6400 2532 2e32 6425 322e 3264 2532 2e32 6425 322e 3264 2532 2e32 6425 322e 3264 0020 2020 2020 2020 2020 2020 2000 2020
0747160 2020 2020 2020 2020 2020 0072 0055 6e61 626c 6520 746f 2064 656c 6574 6520 6669 6c65 2025 730a 0000 2448 6561 6465 723a
0747240 206c 7369 6464 6e2e 632c 7620 3130 2e30 2038 392f 3035 2f30 3920 3135 3a31 343a 3433 2063 6c78 3132 3021 7369 6d6c 6962
0747320 2045 7870 2024 0000 2448 6561 6465 723a 206c 7369 7379 732e 682c 7620 3130 2e30 2038 392f 3035 2f30 3920 3135 3a34 303a
0747400 3135 2063 6c31 3230 2173 696d 6c69 6220 4578 7020 2400 0000 2448 6561 6465 723a 206c 7369 6465 662e 682c 7620 3130 2e31
0747460 2038 392f 3038 2f32 3220 3139 3a31 343a 3437 2063 6c31 3230 2163 686f 6e67 2045 7870 2024 0000 0000 2024 4865 6164 6572
0747540 3a20 6c73 696c 6962 2e68 2c76 2031 302e 3020 3839 2f30 352f 3039 2031 353a 3235 3a33 3420 636c 3132 3021 7369 6d6c 6962
0747620 2045 7870 2024 2000 2024 4865 6164 6572 3a20 6c73 6963 6f6e 662e 682c 7620 3130 2e30 2038 392f 3035 2f30 3920 3135 3a31
0747700 323a 3332 2063 6c78 3132 3021 7369 6d6c 6962 2045 7870 2024 0000 0000 2448 6561 6465 723a 206c 7369 6770 616c 2e68 2c76
0747760 2031 302e 3020 3839 2f30 352f 3039 2031 353a 3231 3a34 3320 636c 3132 3021 7369 6d6c 6962 2045 7870 2024 0000 2448 6561
0750040 6465 723a 206d 612e 682c 7620 3130 2e31 2038 392f 3031 2f31 3220 3135 3a32 393a 3034 2063 6c78 3131 3121 7469 6d20 546f
0750120 6f6c 6c69 6220 2400 2024 4865 6164 6572 3a20 6c73 696d 6163 2e68 2c76 2031 302e 3020 3839 2f30 352f 3039 2031 353a 3236
0750200 3a30 3920 636c 7831 3230 2173 696d 6c69 6220 4578 7020 2400 2448 6561 6465 723a 206c 7369 6e68 7368 2e68 2c76 2031 302e
0750260 3120 3839 2f30 382f 3135 2031 323a 3139 3a33 3920 636c 3132 3021 7469 6d20 4578 7020 2400 0000 0000 6464 6e61 6d65 0072
0750340 0057 6172 6e69 6e67 3a20 436f 756c 646e 2774 206f 7065 6e20 6669 6c65 2025 7320 7768 656e 2063 616c 6c65 6420 7769 7468
0750420 206c 6f67 6963 616c 5f6e 616d 6520 2573 210a 0064 646e 616d 6500 2573 2573 0057 6172 6e69 6e67 3a20 4261 6420 666f 726d
0750500 6174 206f 6620 6669 6c65 3a20 2573 210a 0064 646e 616d 6500 5761 726e 696e 673a 204c 6f67 6963 616c 206e 616d 6520 2573
0750560 206e 6f74 2066 6f75 6e64 2069 6e20 6669 6c65 2025 7321 0a00 6464 6e61 6d65 0000 2448 6561 6465 723a 206c 7369 6e68 7368
0750640 2e63 2c76 2031 302e 3120 3839 2f30 382f 3135 2031 343a 3134 3a30 3220 636c 7831 3131 2174 696d 2045 7870 2024 0000 0000
0750720 2448 6561 6465 723a 206d 612e 682c 7620 3130 2e31 2038 392f 3031 2f31 3220 3135 3a32 393a 3034 2063 6c78 3131 3121 7469
0751000 6d20 546f 6f6c 6c69 6220 2400 0000 000a 2024 4865 6164 6572 3a20 6c73 696c 6962 2e63 2c76 2031 302e 3120 3839 2f30 362f
0751060 3230 2031 353a 3234 3a34 3520 636c 3834 2170 6766 2045 7870 2024 0000 2448 6561 6465 723a 206c 7369 7379 732e 682c 7620
0751140 3130 2e30 2038 392f 3035 2f30 3920 3135 3a34 303a 3135 2063 6c31 3230 2173 696d 6c69 6220 4578 7020 2400 0000 2448 6561
0751220 6465 723a 206c 7369 6770 616c 2e68 2c76 2031 302e 3020 3839 2f30 352f 3039 2031 353a 3231 3a34 3320 636c 3132 3021 7369
0751300 6d6c 6962 2045 7870 2024 0000 2448 6561 6465 723a 206d 612e 682c 7620 3130 2e31 2038 392f 3031 2f31 3220 3135 3a32 393a
0751360 3034 2063 6c78 3131 3121 7469 6d20 546f 6f6c 6c69 6220 2400 2448 6561 6465 723a 206c 7369 6e68 7368 2e68 2c76 2031 302e
0751440 3120 3839 2f30 382f 3135 2031 323a 3139 3a33 3920 636c 3132 3021 7469 6d20 4578 7020 2400 2024 4865 6164 6572 3a20 6c69
0751520 6264 6566 2e68 2c76 2031 302e 3020 3839 2f30 352f 3039 2031 353a 3034 3a35 3920 636c 3132 3021 7369 6d6c 6962 2045 7870
0751600 2024 0000 0000 0000 0000 0001 0000 0001 4c53 4920 4c6f 6769 6320 436f 7270 6f72 6174 696f 6e00 0000 2020 0000 4c49 4220
0751660 464f 524d 4154 2036 0a00 0000 0000 0009 0102 0408 1020 4080 0000 0000 0000 0000 0000 0000 0000 0000 0000 0000 0000 0000
0751740 5365 656b 696e 6720 7265 636f 7264 2025 6400 3230 3120 2d20 5365 656b 2065 7272 6f72 2074 6f20 706f 7369 7469 6f6e 2025
0752020 6400 3230 3220 2120 4661 696c 6564 2074 6f20 7265 6164 2061 2072 6563 6f72 6400 7772 6974 655f 7265 636f 7264 0031 3031
0752100 202d 2057 7269 7465 2074 6f20 6c69 6272 6172 7920 6661 696c 6564 202d 2d20 6669 6c65 2073 7973 7465 6d20 6d61 7920 6265
0752160 2066 756c 6c00 3130 3220 2d20 5772 6974 6520 746f 206c 6962 7261 7279 2066 6169 6c65 6420 2d2d 2066 696c 6520 7379 7374
0752240 656d 206d 6179 2062 6520 6675 6c6c 004c 4942 0032 3133 202d 204f 6c64 206c 6962 7261 7279 2063 6f64 6520 6361 6c6c 6564
0752320 206f 6e20 6e65 7720 6c69 6272 6172 7900 5355 4e34 000a 004c 4942 2030 3020 5820 0053 554e 3400 0a00 6372 6561 7465 5f68
0752400 6561 6465 7200 5041 5254 4941 4c20 4c49 420a 0054 616b 696e 6720 7265 636f 7264 2025 6400 3430 3120 2d20 546f 6f6b 206e
0752460 6f6e 2d65 7869 7374 656e 7420 7265 636f 7264 2025 6400 3431 3120 2d20 546f 6f6b 2072 6563 6f72 6420 2564 2074 7769 6365
0752540 0044 726f 7070 696e 6720 7265 636f 7264 2025 6400 3230 3320 2d20 4472 6f70 7065 6420 6e6f 6e2d 6578 6973 7465 6e74 2072
0752620 6563 6f72 6420 2564 0034 3032 202d 2043 616e 6e6f 7420 6669 6e64 2066 7265 6520 6269 7400 4578 7061 6e64 696e 6720
0752700 6269 7420 6d61 7000 7264 0072 0077 6400 7264 0072 6200 7262 0077 6400 7700 7764 0072 6400 612b 0061 2b00 3330 3120 2d20
0752760 496c 6c65 6761 6c20 6f70 656e 206d 6f64 6520 666f 7220 6c6f 7065 6e3a 2025 7300 4361 6c6c 696e 6720 666f 7072 6561 6428
0753040 2900 4361 6c6c 696e 6720 666f 7077 7269 7465 2829 0043 616c 6c69 6e67 2066 6f70 656e 2c20 6d6f 6465 2027 2573 2700 3230
0753120 3420 2d20 496e 636f 6e73 6973 7465 6e74 2064 6972 6563 746f 7279 206f 7220 6269 7420 6d61 7000 3230 3520 2d20 496e 636f
0753200 6e73 6973 7465 6e74 2064 6972 6563 746f 7279 206f 7220 6269 7420 6d61 7000 456e 7465 7265 6420 6c6f 7065 6e28 2573 2c20
0753260 2573 2900 6f70 656e 696e 6720 6120 6c69 6272 6172 7900 6f70 656e 696e 6720 6120 6c69 6272 6172 7920 666f 7220 7265 6164
0753340 2f77 7269 7465 006f 7065 6e69 6e67 2061 206c 6962 7261 7279 2066 6f72 2072 6561 6400 4661 696c 6564 206c 6f70 656e 0033
0753420 3032 202d 2054 6865 206c 6962 7261 7279 2069 7320 616c 7265 6164 7920 6f70 656e 0046 6169 6c65 6420 6c6f 7065 6e00 6c6f
0753500 6164 7365 7120 6469 7265 6374 6f72 7900 436f 6d70 6c65 7465 6420 6c6f 7065 6e00 6c6f 6164 7365 7120 6269 7420 6d61 7000
0753560 436f 6d70 6c65 7465 6420 6c6f 7065 6e00 3230 3620 2d20 4475 706c 6963 6174 6520 6d65 6d62 6572 206e 616d 6573 2069 6e20
0753640 6c69 6272 6172 7900 3230 3720 2d20 4d65 6d62 6572 2025 7320 6973 2069 6e63 6f6e 7369 7374 656e 7400 3231 3220 2d20 4f6c
```

```
0753720 6420 6c69 6272 6172 7920 636f 6465 2063 616c 6c65 6420 6f6e 206e 6577 206c 6962 7261 7279 0032 3038 202d 2044 6972 6563
0754000 746f 7279 206c 6f61 6420 6661 696c 6564 0045 6e74 6572 6564 206c 636c 6f73 6500 636c 6f73 696e 6720 6120 6c69 6272 6172
0754060 7900 3330 3320 2d20 4c69 6272 6172 7920 706f 696e 7465 7220 6973 204e 554c 4c00 436f 6d70 6c65 7465 6420 6c63 6c6f 7365
0754140 202d 206c 6962 7261 7279 2073 7469 6c6c 2069 6e20 7573 6500 4f70 656e 206d 656d 6265 7220 2725 7327 2063 6c6f 7365 6420
0754220 6175 746f 6d61 7469 6361 6c6c 7920 696e 206c 636c 6f73 6528 2900 436f 6d70 6c65 7465 6420 6c63 6c6f 7365 0057 7269 7469
0754300 6e67 2064 6972 6563 746f 7279 0034 3033 202d 2046 696c 6520 7369 7a65 2069 7320 696e 636f 6e73 6973 7465 6e74 0077 7269
0754360 7465 6469 7265 6374 6f72 7900 3430 3420 2d20 4120 6469 7265 6374 6f72 7920 706f 696e 7465 7220 6973 204e 554c 4c00 3430
0754440 3520 2d20 4c69 6272 6172 7920 6469 7265 6374 6f72 7920 6973 2069 6e63 6f6e 7369 7374 656e 7400 3430 3620 2d20 4469 7265
0754520 6374 6f72 7920 7772 6974 6520 6661 696c 6564 0034 3037 202d 2054 6865 2069 6e2d 6d65 6d6f 7279 206c 6962 7261 7279 2064
0754600 6972 6563 746f 7279 2069 7320 696e 636f 6e73 6973 7465 6e74 0057 7269 7469 6e67 2062 6974 206d 6170 0077 7269 7465 6269
0754660 746d 6170 0034 3038 202d 2042 6974 206d 6170 2073 697a 6520 636f 756c 6420 6e6f 7420 6265 2063 6f6d 7075 7465 6400 3430
0754740 3920 2d20 4269 7420 6d61 7020 636f 756c 6420 6e6f 7420 6265 2077 7269 7474 656e 0077 6600 7266 0072 6600 2e00 7266 0053
0755020 002e 0072 6600 4f70 656e 696e 6720 6d65 6d62 6572 2027 2573 272c 206d 6f64 6520 2725 7327 006f 7065 6e69 6e67 2061 206c
0755100 6962 7261 7279 206d 656d 6265 7200 3330 3420 2d20 496c 6c65 6761 6c20 7061 7261 6d65 7465 7273 2074 6f20 6d6f 7065 6e00
0755160 3330 3520 2d20 496c 6c65 6761 6c20 6d6f 7065 6e20 6d6f 6465 2027 2563 272e 2020 4d65 6d62 6572 2069 7320 2725 7327 0033
0755240 3036 202d 2054 7269 6564 2074 6f20 6f70 656e 206d 656d 6265 7220 2725 7327 206f 6620 7265 6164 206f 6e6c 7920 6c69 6272
0755320 6172 7920 666f 7220 7772 6974 6500 4372 6561 7469 6e67 206d 656d 6265 7220 2725 7327 0033 3037 202d 2054 7269 6564 2074
0755400 6f20 6f70 656e 206d 656d 6265 7220 2725 7327 2077 6869 6368 2077 6173 2061 6c72 6561 6479 206f 7065 6e00 3230 3920 2d20
0755460 5472 6965 6420 746f 2061 7070 656e 6420 746f 2069 6e63 6f6e 7369 7374 656e 7420 6d65 6d62 6572 2025 7300 4c53 494c 4942
0755540 2e4d 454d 4244 554d 5000 7700 6100 3130 3320 2d20 556e 6162 6c65 2074 6f20 6f70 656e 204d 454d 4244 554d 5020 6669 6c65
0755620 0064 726f 705f 6165 6d62 6572 0032 3130 202d 204d 656d 6265 7220 2573 2069 7320 696e 636f 6e73 6973 7465 6e74 0025 640a
0755700 0043 6c6f 7369 6e67 206d 6561 6265 7200 636c 6f73 696e 6720 6120 6c69 6272 6172 7920 6d65 6d62 6572 0033 3038 202d 204d
0755760 656d 6265 7220 706f 696e 7465 7220 6973 204e 554c 4c00 0a23 0a25 6420 6279 7465 732c 2025 6420 7265 636f 7264 730a 0044
0756040 656c 6574 696e 6720 6d65 6d62 6572 2027 2573 2700 6465 6c65 7469 6e67 2061 206c 6962 7261 7279 206d 656d 6265 7200 3330
0756120 3920 2d20 4c69 6272 6172 7920 706f 696e 7465 7220 6973 204e 554c 4c00 3331 3020 2d20 5472 6965 6420 746f 2064 656c 6574
0756200 6520 6672 6f6d 2061 2072 6561 642d 6f6e 6c79 206c 6962 7261 7279 0033 3131 202d 2054 7269 6564 2074 6f20 6465 6c65 7465
0756260 206f 7065 6e20 6d65 6d62 6572 2027 2573 2700 7265 6164 696e 6720 6672 6f6d 2061 206c 6962 7261 7279 0032 3131 202d 204d
0756340 656d 6265 7220 2725 7327 2069 7320 696e 636f 6e73 6973 7465 6e74 006d 6765 7463 0072 6561 6400 6d75 6e67 6574 6300 7265
0756420 6164 0077 7269 7469 6e67 2069 6e74 6f20 6120 6c69 6272 6172 7900 2564 0a00 2564 0a00 6d70 7574 6300 7772 6974 006d 7265
0756500 6164 0072 6561 6400 6d67 7261 6200 7265 6164 006c 6578 5f6d 656d 6265 7200 7265 6164 006d 7772 6974 6500 7772 6974 006d
0756560 7072 696e 7466 0077 7269 7400 4361 6c6c 6564 206c 6e61 6d65 0043 616c 6c65 6420 6c73 697a 6520 286d 656d 6265 7220 2725
0756640 7327 2900 7265 6164 696e 6720 6120 6c69 6272 6172 7920 6469 7265 6374 6f72 7900 3431 3020 2d20 5468 6520 696e 2d6d 656d
0756720 6f72 7920 6469 7265 6374 6f72 7920 6973 2069 6e63 6f6e 7369 7374 656e 7400 4361 6c6c 6564 206d 696e 666f 0043 616c 6c65
0757000 6420 6c69 6266 696c 6500 4361 6c6c 6564 206d 656d 6264 6174 6500 3030 3030 3030 3030 3030 3030 0043 616c 6c65 6420 7365
0757060 746d 656d 6264 6174 6500 4361 6c6c 6564 206c 6962 5f66 7265 655f 6279 7465 7300 4475 6d70 696e 6720 6d65 6d62 6572 2025
0757140 7300 3331 3220 2120 5472 6965 6420 746f 206d 656d 6264 756d 7020 7477 6f20 6d65 6d62 6572 732c 2025 7320 616e 6420 2573
0757220 0069 6e67 2061 206c 6962 7261 7279 206d 656d 6265 7200 3331 3320 2d20 4d65 6d62 6572 2070 6f69 6e74 6572 2069 7320 4e55
0757300 4c4c 0033 3134 202d 204d 656d 6265 7220 6d6f 6465 2069 7320 7772 6f6e 6700 3331 3520 2d20 496c 6c65 6761 6c20 7061 7261
0757360 6d65 7465 7273 2073 7570 706c 6965 6420 6279 2063 616c 6c69 6e67 2070 726f 6772 616d 002d 2d2d 2020 2020 2020 002e 0a00
0757440 2d2d 2d20 2000 0a00 4c53 494c 4942 2e45 5252 0077 0041 6e20 6572 726f 7220 6f63 6375 7272 6564 2077 6869 6c65 2074 6865
0757520 2070 726f 6772 616d 2077 6173 2025 732e 0054 6865 206c 6962 7261 7279 2069 6e76 6f6c 7665 6420 6973 206e 6f74 206b 6e6f
0757600 776e 2e00 7200 5468 6520 6c69 6272 6172 7920 696e 766f 6c76 6564 2069 7320 2725 7327 2e00 506c 6561 7365 2063 6f6e 7461
0757660 6374 3a00 5468 6973 2069 7320 7072 6f62 6162 6c79 2061 2066 696c 6520 7379 7374 656d 2070 726f 626c 656d 2e00 4966 206e
0757740 6563 6573 7361 7279 2c20 7472 7920 6465 6c65 7469 6e67 2074 6865 206c 6962 7261 7279 2e00 4966 2074 6865 2070 726f 626c
0760020 656d 2070 6572 7369 7374 732c 2070 6c65 6173 6520 636f 6e74 6163 743a 0054 7279 2064 656c 6574 696e 6720 7468 6520 6c69
0760100 6272 6172 7920 616e 6420 7265 6372 6561 7469 6e67 2069 742e 0049 6620 7468 6520 7072 6f62 6c65 6d20 7065 7273 6973 7473
0760160 2c20 706c 6561 7365 2063 6f6e 7461 6374 3a00 2020 2020 2573 0020 2020 2025 7300 4465 7363 7269 7074 696f 6e20 6f66 2065
0760240 7272 6f72 2063 6f6e 6469 7469 6f6e 3a00 2020 2020 5468 6520 6c69 6272 6172 7920 7375 6272 6f75 7469 6e65 2077 6173 2063
0760320 616c 6c65 6420 696e 636f 7272 6563 746c 792e 0020 2020 2045 7272 6f72 206f 6363 7572 7265 6420 696e 206c 6962 7261 7279
0760400 2073 7562 726f 7574 696e 6520 2725 7327 2e00 2020 2020 4572 726f 7220 7472 6163 6520 696e 666f 726d 6174 696f 6e3a 2025
0760460 7300 2020 2020 4572 726f 7220 6f63 6375 7272 6564 2064 7572 696e 6720 6c69 6272 6172 7920 6f70 6572 6174 696f 6e20 2564
0760540 2e0a 002d 2d2d 2020 4572 726f 7220 7265 706f 7274 2063 6f75 6c64 206e 6f74 2062 6520 7772 6974 7465 6e20 746f 2061 2066
0760620 696c 652e 0a0a 002d 2d2d 2020 5265 706f 7274 2061 6c73 6f20 7772 6974 7465 6e20 746f 2074 6865 2066 696c 6520 274c 5349
0760700 4c49 422e 4552 5227 2e0a 0a00 2d2d 206c 6962 7472 6163 6520 3a20 0025 7300 4c53 494c 4942 2e53 4e45 414b 0072 0045 6e74
0760760 6572 2073 6e65 616b 2070 6173 7377 6f72 642e 0a00 0057 726f 6e67 0a00 5452 4143 4500 4455 4d50 0057 4154 4348 004c 5349
```

```
0761040 4c49 422e 4558 5045 4354 4544 0077 004c 5349 4c49 422e 4143 5455 414c 0077 0052 4543 4f52 4453 000a 4261 6420 4c53 494c
0761120 4942 2e53 4e45 414b 2066 696c 650a 0000 2020 2448 6561 6465 723a 206c 7369 6c65 782e 632c 7620 3130 2e30 2038 392f 3035
0761200 2f30 3920 3135 3a32 333a 3536 2063 6c78 3132 3021 7369 6d6c 6962 2045 7870 2024 2000 0000 2448 6561 6465 723a 206c 7369
0761260 6770 616c 2e68 2c76 2031 302e 3020 3839 2f30 352f 3039 2031 353a 3231 3a34 3320 636c 3132 3021 7369 6d6c 6962 2045 7870
0761340 2024 0000 2448 6561 6465 723a 206d 612e 682c 7620 3130 2e31 2038 392f 3031 2f31 3220 3135 3a32 393a 3034 2063 6c78 3131
0761420 3121 7469 6d20 546f 6f6c 6c69 6220 2400 2448 6561 6465 723a 206c 7369 6e68 7368 2e68 2c76 2031 302e 3120 3839 2f30 382f
0761500 3135 2031 323a 3139 3a33 3920 636c 3132 3021 7469 6d20 4578 7020 2400 2020 2448 6561 6465 723a 206c 7369 6c65 782e 682c
0761560 7620 3130 2e30 2038 392f 3035 2f30 3920 3135 3a32 343a 3234 2063 6c78 3132 3021 7369 6d6c 6962 2045 7870 2024 2000 0000
0761640 0000 0005 0000 0002 0000 0001 0000 0000 2d2d 2354 6865 2066 6972 7374 2061 7267 756d 656e 7420 746f 2027 2573 2720 7761
0761720 7320 6e6f 7420 6120 542d 5374 7265 616d 210a 0041 4243 4445 4647 4849 4a4b 4c4d 4e4f 5051 5253 5455 5657 5859 5a5f 0061
0762000 6263 6465 6667 6869 6a6b 6c6d 6e6f 7071 7273 7475 7677 7879 7a00 3031 3233 3435 3637 3839 0020 090c 0a0d 0041 4243 4445
0762060 4647 4849 4a4b 4c4d 4e4f 5051 5253 5455 5657 5859 5a5f 0061 6263 6465 6667 6869 6a6b 6c6d 6e6f 7071 7273 7475 7677 7879
0762140 7a00 3031 3233 3435 3637 3839 002e 2f0a 002e 232b 2d00 6c65 786c 6574 7465 7200 6c65 7869 6e73 656e 7369 7469 7665 006c
0762220 6578 6e6f 6e65 7374 006c 6578 756e 6172 7900 6c65 7877 6f72 6b66 756e 6300 6c65 7865 7272 6675 6e63 006c 6578 7175 6f74
0762300 6500 6c65 7872 6573 7764 0049 6c6c 6567 616c 2074 6f6b 656e 206e 756d 6265 7220 2564 2066 6f72 2072 6573 6572 7665 6420
0762360 776f 7264 2027 2573 272e 0a00 5265 7365 7276 6564 2069 6c6c 6567 616c 206f 7065 7261 746f 7220 2573 0a00 6c65 7872 776f
0762440 7264 7300 6c65 7863 6f64 656e 756d 006c 6578 6f70 656e 0043 6f6d 6d65 6e74 2073 7461 7274 696e 6720 6f6e 206c 696e 6520
0762520 2564 2064 6f65 7320 6e6f 7420 656e 642e 0a00 4c69 7465 7261 6c20 6973 206e 6f74 2074 6572 6d69 6e61 7465 6420 696e 206c
0762600 696e 6520 2564 2e0a 004c 6974 6572 616c 2069 7320 746f 6f20 5c6f 6e67 2069 6e20 6c69 6e65 2025 642e 0a00 6c65 786c 6368
0762660 6172 006c 6578 6368 6172 006c 6578 6c69 6e65 7661 7200 6c65 7867 7261 6200 6c65 786c 6f61 6400 6c65 7867 6574 004e 756d
0762740 6265 7220 6973 2074 6f6f 206c 6f6e 6720 696e 206c 696e 6520 2564 2e0a 0049 6c6c 6567 616c 2069 6e70 7574 2069 6e20 6c69
0763020 6e65 2025 642e 0a00 2448 6561 6465 723a 206c 7369 666f 702e 632c 7620 3130 2e33 2038 392f 3036 2f32 3920 3136 3a32 343a
0763100 3131 2063 6c38 3421 7067 6620 4578 7020 2400 0000 2448 6561 6465 723a 206c 7369 6770 616c 2e68 2c76 2031 302e 3020 3839
0763160 2f30 352f 3039 2031 353a 3231 3a34 3320 636c 3132 3021 7369 6d6c 6962 2045 7870 2024 0000 2448 6561 6465 723a 206d 612e
0763240 682c 7620 3130 2e31 2038 392f 3031 2f31 3220 3135 3a32 393a 3034 2063 6c78 3131 3121 7469 6d20 546f 6f6c 6c69 6220 2400
0763320 2448 6561 6465 723a 206c 7369 6e68 7368 2e68 2c76 2031 302e 3120 3839 2f30 382f 3135 2031 323a 3139 3a33 3920 636c 3132
0763400 3021 7469 6d20 4578 7020 2400 2448 6561 6465 723a 206c 7369 7379 732e 682c 7620 3130 2e30 2038 392f 3035 2f30 3920 3135
0763460 3a34 303a 3135 2063 6c31 3230 2173 695d 6c69 6220 4578 7020 2400 0000 0004 0a08 0004 0a21 0004 0a37 0004 0a50 0004 0a66
0763540 0004 0a7c 0004 0a87 0004 0aa1 0004 0ab9 0004 0abf 0004 0ad5 0004 0afa 0004 0b10 0004 0b1a 0004 0b34 0004 0b46 0004 0b5e
0763620 0004 0b7c 0004 0b98 0004 0bb0 0004 0bca 0004 0be2 0004 0bf8 0004 0c10 0004 0c2d 0004 0c4a 0004 0c67 0004 0c81 0004 0c9b
0763700 0004 0ca4 0004 0cbe 0004 0cd4 0004 0cea 0004 0d03 0004 0d1f 0004 0d35 0004 0d4b 0004 0d63 0004 0d7b 0004 0d98 0004 0db0
0763760 0004 0dc6 0004 0dd0 0004 0dea 0004 0e02 0004 0e08 0004 0e1e 0004 0e34 0004 0e4a 0004 0e5c 0004 0e79 0004 0e8f 0004 0e99
0764040 0004 0eaf 0004 0ec6 0004 0ee0 0004 0ee6 0004 0f02 0004 0f1f 0004 0f36 0004 0f4c 0004 0f62 0004 0f69 0004 0f82 0004 0f9a
0764120 0004 0fb4 0004 0fce 0004 0fe8 0004 1004 0004 101e 0004 1034 0004 104c 0004 1066 0004 1080 0004 1096 0004 10b6 0004 10cc
0764200 0004 10e1 0004 10f2 0004 110d 0004 1123 0004 1144 0004 115d 0004 1173 0004 1191 0004 11ab 0004 11c1 0004 11c7 0004 11dd
0764260 0004 11ee 0004 120b 0004 1228 0004 123f 0004 1246 0004 125c 0004 1273 0004 128d 0004 12a3 0004 12bb 0004 12d3 0004 12e9
0764340 0004 1301 0004 131d 0004 1339 0004 1354 0004 1370 0004 1389 0004 13a5 0004 13bb 0004 13d2 0004 13f1 0004 1410 0004 1430
0764420 0004 144c 0004 1465 0004 147b 0004 14a1 0004 14b7 0004 14d6 0004 14f0 0004 150a 0004 1513 0004 152b 0004 1534 0004 154f
0764500 0004 156c 0004 158a 0004 15a8 0004 15b2 0004 15c8 0004 15e2 0004 15fc 0004 1615 0004 1630 0004 1648 0004 1665 0004 167d
0764560 0004 1694 0004 16ad 0004 16ba 0004 16c7 0004 16d4 0004 16e1 0004 16f2 0004 1700 0004 170e 0004 1718 0004 1725 0004 1732
0764640 0004 1738 0004 1756 0004 1773 0004 1791 0004 17bd 0004 17ea 0000 0000 0000 0000 0000 0000 0000 0000 0000 0000 0000 0000
0764720 0000 0000 0000 0000 0000 0000 0000 0000 0000 0000 0000 0000 0000 0000 0000 0000 0000 0000 0000 0000 0000 0000 0000 0000
0765000 0000 0000 0000 0000 2d44 4546 4155 4c54 202b 5458 5420 202f 5859 5a5a 592e 264f 002d 4558 4143 5420 2020 2b54 5854 2020
0765060 2f58 595a 5a59 0023 2043 4d53 2055 4e49 5820 5359 5354 454d 5620 4f54 4845 5200 494e 434e 4554 2020 202d 4942 4d20 202f
0765140 2646 2e26 4f00 4e45 5420 2020 2020 202d 4942 4d20 202f 2646 2e26 4f00 3d20 4253 4c20 4253 4554 0053 434c 2020 2020 2020
0765220 2d49 424d 2020 2f26 4d2e 264f 2654 2656 0044 5350 2020 2020 2020 2d49 424d 2020 2f26 4d2e 264f 2656 003d 2054 4946 0050
0765300 4144 4c4f 4144 2020 2d49 4241 2020 2f26 4d2e 264f 003d 2053 5953 4c4f 4144 204f 5054 5350 4543 2050 4154 4820 4244 434d
0765360 4420 5359 5320 5344 4600 5749 524c 454e 2020 202d 4942 4d20 202f 2450 2e26 4f00 3d20 5749 524c 454e 3300 5041 5420 2020
0765440 2020 202d 5458 5420 202f 264d 2e26 5026 5426 5600 3d20 5450 5420 5241 4d20 524f 4d20 524d 4f00 5449 5020 2020 2020 202d
0765520 5458 5420 202f 2450 2656 2e26 4f00 504c 4f54 2020 2020 202d 5458 5420 202f 264d 2e26 4350 504c 5426 5426 5600 4143 5445
0765600 5354 2020 202d 5458 5420 202f 2450 2656 2e26 5041 4326 5300 5445 5354 4155 5820 202d 5458 5420 202f 2450 2656 2e26 5300
0765660 5445 5354 5645 4320 202d 5458 5420 202f 2450 2656 2e26 5026 5300 5445 5354 5052 4720 202d 5458 5420 202f 2450 2656 2e26
0765740 5300 425a 494d 2020 2020 202d 5458 5420 202f 264d 2e26 4f00 5a4a 4f42 2020 2020 202d 5458 5420 202f 264d 2e26 4f26 5600
0766020 5349 4d4c 5354 2020 202d 4c53 5420 202f 264d 2e26 4353 494d 2654 2656 0046 494d 4c53 5420 2020 2d4c 5354 2020 2f26 4d2e
0766100 2643 4649 4d26 5426 5600 5a49 4d4c 5354 2020 202d 4c53 5420 202f 264d 2e26 435a 494d 2654 2656 0046 4c54 4c53 5420 2020
```

```
0766160 2d4c 5354 2020 2f26 4d2e 264f 2654 2656 0044 5350 4c53 5420 2020 2d4c 5354 2020 2f26 4d2e 2643 264f 2656 003d 2054 4950
0766240 4c53 5400 5246 4c53 5420 2020 202d 4c53 5420 202f 264d 2e26 4326 5026 4f00 4c43 4d50 4c53 5420 202d 4c53 5420 202f 2646
0766320 2e26 4f00 5443 4d50 4c53 5420 202d 4c53 5420 202f 2646 2e26 4f00 3d20 4243 4d50 4c53 5420 4249 4e54 4c53 5420 5450 4c4c
0766400 5354 0042 4c4e 4b4c 5354 2020 2d4c 5354 2020 2f26 462e 424c 494e 4b4c 5354 004c 494e 4b4c 5354 2020 2d4c 5354 2020 2f26
0766460 4d2e 264f 0054 4c49 4e4b 4c53 5420 2d4c 5354 2020 2f26 4d2e 264f 003d 2044 4c59 4c53 5420 5445 5354 4c53 5420 5645 524c
0766540 5354 004c 544f 474c 5354 2020 2d4c 5354 2020 2f26 4d2e 2643 264f 0050 4f57 4c53 5420 2020 2d4c 5354 2020 2f26 4d2e 2643
0766620 504f 5726 5426 5600 5445 5354 4c53 5420 202d 4c53 5420 202f 2450 2650 2e26 5300 5041 4452 4546 2020 202d 4641 5420 202f
0766700 2450 2e26 4f00 3d20 5041 4452 4546 3300 544c 4942 5520 2020 202d 4c49 4220 202f 264d 2e54 5354 4c49 4200 4653 5620 2020
0766760 2020 202d 4c49 4220 202f 264d 2e26 4f26 5600 3120 4649 4d00 464c 5420 2020 2020 202d 4c49 4220 202f 264d 2e26 4f00 5345
0767040 474c 454e 2020 202d 4249 4e20 202f 2450 2e26 4f00 5a46 4620 2020 2020 202d 4249 4e20 202f 264d 2e26 4f00 3d20 5a46 5020
0767120 5349 4620 5a52 4620 5a52 5000 2320 434d 5320 554e 4958 2053 5353 5445 4d56 2056 4d53 204f 5448 4552 004c 4942 2020 2020
0767200 2020 2b4c 4942 2020 2f24 502e 264f 003d 2042 4f4c 2042 4d4c 0043 5052 2020 2020 2020 2b4c 4942 2020 2f24 542e 264f 0050
0767260 414e 4c49 4220 2020 2b4c 4942 2020 2f4c 5349 2e26 4f00 5341 5620 2020 2020 202d 4c49 4220 202f 264d 2e26 4326 4f26 5600
0767340 3d20 4453 5600 434b 5020 2020 2020 202d 4c49 4220 202f 264d 2e26 4326 4f26 5426 5600 5253 5420 2020 2020 202d 4c49 4220
0767420 202f 264d 2e26 4343 4b50 264c 2656 0054 524d 2020 2020 2020 2d4c 4942 2020 2f24 502e 4155 4400 5349 4d20 2020 2020 202d
0767500 4c49 4220 202f 264d 2e26 4f00 4154 4720 2020 2020 202d 4c49 4220 202f 264d 2e26 4f00 3d20 5a43 4150 0044 5356 2020 2020
0767560 2020 2d4c 4942 2020 2f26 4d2e 4453 5626 5600 5349 4d20 2020 2020 2021 4c49 4220 202f 264d 2e26 4f26 5600 5445 4348 574c
0767640 4220 202b 4c49 4220 202f 2454 2e57 4952 4c49 4200 5052 4f4a 574c 4220 202b 4c49 4220 202f 2450 2e57 4952 4c49 4200 5a50
0767720 5249 4d20 2020 202b 4c49 4220 202f 5a50 5249 4d2e 4c49 4200 544c 4942 2020 2020 202b 4c49 4220 202f 5453 542e 5355 5050
0770000 4f52 5400 544c 4942 5420 2020 202b 4c49 4220 202f 2454 2e54 5354 4c49 4200 544c 4942 5820 2020 202b 4c49 4220 202f 264d
0770060 2e26 5300 544c 4942 5920 2020 202b 4c49 4220 202f 264d 2e54 4c49 4200 4650 5249 4d20 2020 202b 4c49 4220 202f 5a50 5249
0770140 4d2e 4c49 4200 4449 5420 2020 2020 202b 5458 5420 202f 264d 2e26 4f26 5626 5300 5343 4c31 5420 2020 202b 5458 5420 202f
0770220 264d 2e26 4f00 3d20 5343 4c31 5520 5343 4c31 5720 5450 5431 5420 5450 5431 5520 5450 5431 5700 5452 4d4c 2020 2020 202b
0770300 4c49 4220 202f 264d 2e26 4f00 4445 4c43 454c 2020 2d49 424d 2020 2f26 4d2e 264f 003d 2058 4445 4c43 454c 2042 4c4f 434b
0770360 5300 3d20 434f 4e4e 4543 5420 4443 5220 4f4c 4444 4352 204c 4f4f 5053 0058 4445 5349 474e 2020 2d49 424d 2020 2f24 502e
0770440 264f 003d 2058 4445 5349 474e 3320 5844 4553 5852 4620 5844 4553 5852 4633 2043 4655 4e00 3d20 4445 5358 5246 3320 4445
0770520 5358 5246 2050 524f 4742 5545 0041 5452 2020 2020 2020 2d54 5854 2020 2f26 462e 264f 003d 2053 4845 4c4c 204d 5041 5420
0770600 5343 414e 2049 4e49 5420 5359 4e4c 4f47 004d 454e 544f 5220 2020 2d54 5854 2020 2f26 4d2e 2643 2650 264f 0044 454c 4441
0770660 5441 2020 2d54 5854 2020 2f26 4d2e 264f 003d 2052 4349 004c 4942 5320 2020 2020 2b54 5854 2020 2f24 542e 264f 003d 2043
0770740 5052 5320 5255 4c45 5320 4c49 4d00 5052 4f46 4441 5441 202b 5458 5420 202f 4c44 5350 524f 462e 4441 5441 004d 4153 5444
0771020 4154 4120 2b54 5854 2020 2f4c 4453 4d41 5354 2e44 4154 4100 424f 4c53 2020 2020 202b 5458 5420 202f 424d 4c2e 264f 003d
0771100 2042 4d4c 5300 5052 4f50 5320 2020 202b 5458 5420 202f 2450 2e26 4f00 5355 5050 4f52 5420 202b 5458 5420 202f 4348 4b2e
0771160 264f 0052 4d50 2020 2020 2020 2d54 5854 2020 2f24 502e 524f 4d4d 4150 0052 4f4d 434f 4420 2020 2d54 5854 2020 2f24 502e
0771240 2650 0056 5041 5420 2020 2020 2454 5854 2020 2f26 4d2e 264f 2656 003d 204d 4f4e 2053 4554 204f 4c44 4d4f 4e20 4f4c 4453
0771320 4554 0050 4144 494e 464f 2020 2d54 5854 2020 2f24 502e 264f 0054 4950 2020 2020 2020 2d54 5854 2020 2f24 5026 562e 264f
0771400 0053 4352 414d 2020 2020 2d54 5854 2020 2f26 462e 5343 5241 4d42 4c45 0053 4b45 4c20 2020 2020 2d54 5854 2020 2f26 462e
0771460 534b 454c 4554 4f4e 0050 4b47 2020 2020 2020 2d54 5854 2020 2f26 462e 5041 434b 4147 4500 5350 4543 2020 2020 202d 5458
0771540 5420 202f 2646 2e53 4341 4e53 5045 4300 5a53 5953 2020 2020 202d 5458 5420 202f 5a43 4d50 2e54 4d50 005a 434d 504c 5354
0771620 2020 2d54 5854 2020 2f5a 434d 502e 544d 504c 5354 0046 4e46 5420 2020 2020 2d54 5854 2020 2f26 502e 2653 0048 4541 4420
0771700 2020 2020 2d42 494e 2020 2f43 4150 2e26 4f00 4c4c 4942 4246 2020 202d 4249 4e20 202f 4c49 4252 4152 592e 4d45 4d42 4552
0771760 004c 4c49 424d 4620 2020 2d54 5854 2020 2f4c 4942 5241 5259 2e4d 454d 4245 5200 4c4c 4942 434c 2020 202d 4c49 4220 202f
0772040 4c49 4252 4152 592e 434f 4d50 4c49 4200 4c4c 4942 5346 2020 202d 5458 5420 202f 4c49 4252 4152 592e 5345 5100 4c4c 4942
0772120 5256 2020 202d 5458 5420 202f 2646 2e26 5052 4556 0053 4341 4e4c 5354 2020 2d4c 5354 2020 2f26 4d2e 264f 003d 2046 444c
0772200 4c53 5420 4341 504c 5354 2054 4f50 4c53 5420 5354 444c 5354 204c 4441 534c 5354 0043 5052 4c53 5420 2020 2d4c 5354 2020
0772260 2f26 462e 264f 003d 2045 5850 4c53 5420 4154 524c 5354 2044 4d50 4c53 5420 5350 414d 4c53 5400 5449 504c 5354 2020 202d
0772340 4c53 5420 202f 264d 2e26 4326 4f26 5600 4653 504c 5354 2020 202d 4c53 5420 202f 264d 2e26 4f26 5426 5600 3d20 4652 4e4c
0772420 5354 0046 5852 464c 5354 2020 2d4c 5354 2020 2f26 4d2e 264f 2656 003d 2053 4156 4c53 5400 4348 4b4c 5354 2020 202d 4c53
0772500 5420 202f 264d 2e26 4343 484b 2656 0046 4453 504c 5354 2020 2d4c 5354 2020 2f26 4d2e 2643 464c 5426 5426 5600 5a44 5350
0772560 4c53 5420 202d 4c53 5420 202f 264d 2e44 5350 4c53 5426 5426 5600 4d44 5350 4c53 5420 202d 4c53 5420 202f 264d 2e26 4344
0772640 5350 4c53 5426 5600 3d20 4c44 5350 4c53 5400 4c45 4620 2020 2020 202b 4942 4d20 202f 2454 2e26 4f00 4341 5048 454c 5020
0772720 202b 4942 4d20 202f 4c43 4150 2e48 454c 5000 544f 5048 454c 5020 202b 4942 4d20 202f 4c54 4f50 2e48 454c 5000 4845 4c50
0773000 2020 2020 202b 4942 4d20 202f 4c53 492e 4845 4c50 004e 5854 4845 4c50 2020 2b49 424d 2020 2f4c 4e45 5854 2e48 454c 5000
0773060 5452 414e 5320 2020 202b 4942 4d20 202f 5445 4348 2e26 4f00 444c 4f47 2020 2020 202d 4942 4d20 202f 2450 2656 2e44 4154
0773140 414c 4f47 0042 4454 4553 5420 2020 2d49 424d 2020 2f24 502e 264f 2653 0042 4f4e 4433 2020 2020 2d49 424d 2020 2f24 502e
0773220 494f 4400 2320 554e 4958 2053 5353 5445 4d56 2056 4d53 204f 5448 4552 0021 2054 5854 2020 7220 2020 7700 2120 4942 4d20
```

```
0773300  2072 2020 2077 0021 204c 5354 2020 7220 2020 7700 2120 4641 5420 2072 2020 2077 0023 2055 4e49 5820 564d 5320 4f54 4845
0773360  5200 2120 4249 4e20 2072 6220 2077 6200 2120 4c49 4220 2072 6220 2061 2b00 2320 5359 5354 454d 5600 2120 4249 4e20 2072
0773440  2020 7762 0021 204c 4942 2020 7220 2072 2b00 2320 434d 5300 2120 5458 5420 2072 2020 772c 7265 6366 6d2c 762c 6c72 6563
0773520  6c2c 3531 3200 2120 4942 4d20 2072 2020 772c 7265 6366 6d2c 662c 6c72 6563 6c2c 3830 0021 2046 4154 2020 7220 2077 2c72
0773600  6563 666d 2c66 2c6c 7265 636c 2c31 3333 0021 2042 494e 2020 722c 6269 6e61 7279 2020 772c 6269 6e61 7279 2c72 6563 666d
0773660  2c66 622c 6c72 6563 6c2c 3830 0021 204c 4942 2020 722c 6269 6e61 7279 2020 612b 2c62 696e 6172 792c 7265 6366 6d2c 6662
0773740  2c6c 7265 636c 2c38 3000 2120 4c53 5420 2072 2020 772c 7265 6366 6d2c 7662 612c 6c72 6563 6c2c 3133 3300 0a00 5800 2564
0774020  0057 6172 6e69 6e67 3a20 4669 6c65 206e 616d 6520 2725 7327 2073 686f 756c 6420 6e6f 7420 636f 6e74 6169 6e20 2725 7327
0774100  2e0a 004e 6f20 6669 6c65 2073 7065 6369 6669 6564 2074 6f20 4c53 4946 4f50 002d 4445 4641 554c 5400 0057 6172 6e69 6e67
0774160  3a20 4669 6c65 206e 616d 6520 2725 7327 2000 7472 756e 6361 7465 6420 746f 2027 2573 272e 0a00 5761 726e 696e 673a 2046
0774240  696c 6520 7479 7065 2027 2573 2720 0074 7275 6e63 6174 6564 2074 6f20 2725 7327 2e0a 0025 2d39 733a 2025 7320 2573 202d
0774320  3e20 2573 2c20 2225 7322 2028 2573 290a 005b 4e49 4c5d 005b 4e49 4c5d 004e 0059 0046 4f50 5752 4954 4500 464f 5052 4541
0774400  4400 7200 0048 4f4d 4500 4c53 4942 4153 4500 4c53 4942 4153 4500 4c44 5342 4153 4500 496c 6c65 6761 6c20 6e75 6c6c 2064
0774460  6972 6563 746f 7279 206e 616d 6500 006c 6f6f 6b68 6572 6500 546f 6f20 6d61 6e79 2064 6972 6563 746f 7269 6573 2069 6e20
0774540  7468 6520 7365 6172 6368 2070 6174 682e 0054 5259 2e41 4c53 4f00 7200 534b 4950 0049 6c6c 6567 616c 2046 4f50 2063 6f6e
0774620  7665 6e74 696f 6e3a 0a25 730a 004c 5349 2e46 4f50 0055 4e49 5800 2b00 2d00 5345 5455 5052 4f4a 2e44 4154 4100 5049 4400
0774700  4661 7461 6c20 4572 726f 723a 2020 596f 7520 6861 7665 206e 6f20 5072 6f6a 6563 7420 4944 210a 0054 4543 4800 4449 4500
0774760  4143 4354 0046 4c41 4753 004e 4f4d 0057 4343 4f4d 0057 434d 494c 0057 4349 4e44 0046 4958 4544 0056 4152 4941 424c 4500
0775040  5853 495a 4500 5953 495a 4500 494f 5049 5443 4800 0000 0000 2448 6561 6465 723a 206c 7369 6770 616c 2e63 2c76 2031 302e
0775120  3020 3839 2f30 352f 3039 2031 353a 3231 3a30 3120 636c 7831 3230 2173 696d 6c69 6220 4578 7020 2400 2448 6561 6465 723a
0775200  2065 682e 682c 7620 3130 2e30 2038 392f 3031 2f30 3420 3132 3a34 303a 3335 206f 7069 756d 2174 6f6f 6c6c 6962 2054 6f6f
0775260  6c6c 6962 2024 0000 2448 6561 6465 723a 206c 7369 6770 616c 2e68 2c76 2031 302e 3020 3839 2f30 352f 3039 2031 353a 3231
0775340  3a34 3320 636c 3132 3021 7369 6d6c 6962 2045 7870 2024 0000 2448 6561 6465 723a 206d 612e 682c 7620 3130 2e31 2038 392f
0775420  3031 2f31 3220 3135 3a32 393a 3034 2063 6c78 3131 3121 7469 6420 546f 6f6c 6c69 6220 2400 0000 0000 0000 0000 0000 0000
0775500  0000 0000 0000 0000 2448 6561 6465 723a 206c 7369 736f 7274 2e63 2c76 2031 302e 3020 3839 2f30 352f 3039 2031 353a 3336
0775560  3a34 3920 636c 7831 3230 2173 696d 6c69 6220 4578 7020 2400 2448 6561 6465 723a 206c 7369 6770 616c 2e68 2c76 2031 302e
0775640  3020 3839 2f30 352f 3039 2031 353a 3231 3a34 3320 636c 3132 3021 7369 6d6c 6962 2045 7870 2024 0000 2448 6561 6465 723a
0775720  206d 612e 682c 7620 3130 2e31 2038 392f 3031 2f31 3220 3135 3a32 393a 3034 2063 6c78 3131 3121 7469 6d20 546f 6f6c 6c69
0776000  6220 2400 2448 6561 6465 723a 206c 7369 6e68 7368 2e68 2c76 2031 302e 3120 3839 2f30 382f 3135 2031 323a 3139 3a33 3920
0776060  636c 3132 3021 7469 6d20 4578 7020 2400 0000 0000 0000 0000 0000 0000 0002 768c 0000 0000 0002 79a8 0000 0000 0002 77a0
0776140  0000 0000 0002 79dc 0000 0000 0002 bc0c 0000 0000 0000 0000 0004 1c40 0003 d330 0003 d208 0003 d024 0003 cacc 0003 c8c8
0776220  0000 0000 0000 0000 0000 0000 0002 7a4c 0000 0000 0002 7c9c 0000 0000 0002 7c6c 0000 0000 0002 7c38 0000 0000 0002 7c10
0776300  0000 0000 0002 7be8 0000 0000 0002 7bbc 0000 0000 0002 7b8c 0000 0000 0002 7b5c 0000 0000 0000 0000 0004 1c90 0003 c660
0776360  0003 c510 0004 26ac 0003 db28 0003 dba0 0000 0000 0000 0000 0000 0000 0002 7ae4 0000 0000 0002 7c9c 0000 0000 0000 0000
0776440  0004 1d00 0003 dab0 5250 4c00 4353 4c00 434c 4100 4353 4100 4261 6420 6164 6465 7220 7479 7065 202d 2025 7300 4261 6420
0776520  4164 6465 7220 6c65 6e67 7468 202d 2025 6400 6100 6e00 6200 6e00 636f 0031 0063 6900 3100 7300 6e00 2564 0a25 640a 2564
0776600  0a25 730a 2564 0a0a 710a 0020 0020 000a 004e 4f62 6a65 6374 0000 0000 0000 0000 0000 0000 0000 0000 0000 0000 0002 7f84
0776660  0000 0000 0002 8634 0000 0000 0002 7fb8 0000 0000 0002 84dc 0000 0000 0002 bc0c 0000 0000 0000 0000 0004 1da0 0003 d330
0776740  0003 d208 0003 d024 0003 cacc 0003 c8c8 0000 0000 0000 0000 0000 0000 0002 86d8 0000 0000 0002 8928 0000 0000 0002 88f8
0777020  0000 0000 0002 89c4 0000 0000 0002 889c 0000 0000 0002 8874 0000 0000 0002 8848 0000 0000 0002 8818 0000 0000 0002 87e8
0777100  0000 0000 0000 0000 0004 1df0 0003 c660 0003 c510 0004 26ac 0003 db28 0003 dba0 0000 0000 0000 0000 0000 0000 0002 8770
0777160  0000 0000 0002 8928 0000 0000 0000 0000 0004 1e60 0003 dab0 6c73 695f 4661 7374 006c 7369 5f49 6e76 6572 7465 645f 4f75
0777240  7470 7574 006c 7369 5f48 6967 685f 4472 6976 6500 474e 0042 6164 204d 7578 2064 696d 656e 7369 6f6e 2020 2d20 2564 0042
0777320  6164 204d 7578 206c 656e 6774 6820 2d20 2564 0053 007a 006e 0067 6e00 3100 6430 006e 0064 3100 6e00 6432 006e 0064 3300
0777400  6e00 6434 006e 0064 3500 6e00 6436 006e 0064 3700 6e00 6438 006e 0064 3900 6e00 6431 3000 6e00 6431 3100 6e00 6431 3200
0777460  6e00 6431 3300 6e00 6431 3400 6e00 6431 3500 6e00 7300 7800 7300 6e00 2564 0a25 640a 2564 0a25 730a 2573 0a25 730a 2573
0777540  0a25 730a 2564 0a25 730a 0a71 0a00 3500 3435 0020 0020 000a 004e 4f62 6a65 6374 0000 0000 0000 0000 0000 0000 0000 0000
0777620  0000 0000 0002 8c0c 0000 0000 0002 99d0 0000 0000 0002 8de0 0000 0000 0002 9504 0000 0000 0002 bc0c 0000 0000 0000 0000
0777700  0004 1f88 0003 d330 0003 d208 0003 d024 0003 cacc 0003 c8c8 0000 0000 0000 0000 0000 0000 0002 9a74 0000 0000 0002 9cc4
0777760  0000 0000 0002 9c94 0000 0000 0002 9c60 0000 0000 0002 9c38 0000 0000 0002 9c10 0000 0000 0002 9be4 0000 0000 0002 9bb4
1000040  0000 0000 0002 9b84 0000 0000 0000 0000 0004 1fd8 0003 c660 0003 c510 0004 26ac 0003 db28 0003 dba0 0000 0000 0000 0000
1000120  0000 0000 0002 9b0c 0000 0000 0002 9cc4 0000 0000 0000 0000 0004 2048 0003 dab0 4a6f 686e 736f 6e00 5269 7070 6c65 0042
1000200  696e 6172 795f 5550 0042 696e 6172 795f 446f 776e 0042 696e 6172 795f 5544 0053 6869 6674 0047 7261 795f 5550 0047 7261
1000260  795f 5544 0042 6164 2063 6f75 6e74 6572 2074 7970 6520 2420 2573 0043 4c4e 0043 4400 5344 0043 4500 414c 0053 544e 004c
1000340  4400 6c73 695f 636f 756e 7465 725f 7265 7365 745f 4e00 4261 6420 436f 756e 7465 7220 6c65 6e67 7468 202d 2025 6400 4261
```

```
1000420 6420 6f70 7469 6f6e 7300 4261 6420 6f70 7469 6f6e 7300 4261 6420 6f70 7469 6f6e 7300 4261 6420 6f70 7469 6f6e 7300 4261
1000500 6420 436f 756e 7465 7220 6c65 6e67 7468 202d 2025 6400 4261 6420 5375 625f 4d65 6e75 2069 7465 6d20 2d20 2564 0025 640a
1000560 2564 0a25 640a 2573 0a25 640a 2573 0a25 730a 2573 0a25 730a 0a71 0a00 4261 6420 6f70 7469 6f6e 0025 640a 2564 0a25 640a
1000640 2573 0a25 640a 2564 0a6e 6f0a 710a 0025 640a 2564 0a25 640a 2573 0a25 640a 2573 0a25 730a 2573 0a25 730a 2573 0a25 730a
1000720 2573 0a0a 710a 0025 640a 2564 0a25 640a 2573 0a25 640a 2573 0a25 730a 2573 0a25 730a 2573 0a25 730a 2573 0a25 640a 0a71
1001000 0a00 2564 0a25 640a 2564 0a25 730a 2564 0a25 730a 2573 0a25 730a 0a71 0a00 4261 6420 5375 625f 4d65 6e75 2069 7465 6d20
1001060 2d20 2564 0020 0020 000a 004e 4f62 6a65 6374 0000 0000 0000 0000 0000 0000 0000 0000 0000 0002 9fac 0000 0000 0002 a28c
1001140 0000 0000 0002 9fe0 0000 0000 0002 a18c 0000 0000 0002 bc0c 0000 0000 0000 0000 0004 2248 0003 d330 0003 d208 0003 d024
1001220 0003 cacc 0003 c8c8 0000 0000 0000 0000 0000 0000 0002 a330 0000 0000 0002 a580 0000 0000 0002 a550 0000 0000 0002 a51c
1001300 0000 0000 0002 a4f4 0000 0000 0002 a4cc 0000 0000 0002 a4a0 0000 0000 0002 a470 0000 0000 0002 a440 0000 0000 0000 0000
1001360 0004 2298 0003 c660 0003 c510 0004 26ac 0003 db28 0003 dba0 0000 0000 0000 0000 0000 0000 0002 a3c8 0000 0000 0002 a580
1001440 0000 0000 0000 0000 0004 2308 0003 dab0 6c73 695f 4163 7469 7665 5f48 6967 6800 6c73 695f 4869 6768 5f44 7269 7665 0047
1001520 4e00 4261 6420 4465 636f 6465 7220 6c65 6e67 7468 202d 2025 6400 2564 0a25 640a 2564 0a25 730a 2573 0a25 730a 2573 0a0a
1001600 710a 0020 0020 000a 004e 4f62 6a65 6374 0000 0000 0000 0000 0000 0000 0000 0000 0000 0000 0002 a864 0000 0000 0002 ab38
1001660 0000 0000 0002 a948 0000 0000 0002 aa60 0000 0000 0002 bc0c 0000 0000 0000 0000 0004 2398 0003 d330 0003 d208 0003 d024
1001740 0003 cacc 0003 c8c8 0000 0000 0000 0000 0000 0000 0002 abdc 0000 0000 0002 ae2c 0000 0000 0002 adfc 0000 0000 0002 adc8
1002020 0000 0000 0002 ada0 0000 0000 0002 ad78 0000 0000 0002 ad4c 0000 0000 0002 ad1c 0000 0000 0002 acec 0000 0000 0000 0000
1002100 0004 23e8 0003 c660 0003 c510 0004 26ac 0003 db28 0003 dba0 0000 0000 0000 0000 0000 0000 0002 ac74 0000 0000 0002 ae2c
1002160 0000 0000 0000 0000 0004 2458 0003 dab0 4445 4300 494e 4300 4449 4e43 0042 6164 2044 4963 7265 6d65 6e74 6f72 2074 7970
1002240 6520 2320 2573 006c 7369 5f46 6173 7400 4261 6420 4449 6372 656d 656e 746f 7227 7320 6c65 6e67 7468 202d 2025 6400 2564
1002320 0a25 640a 2564 0a25 640a 2573 0a25 640a 0a71 0a00 2000 2000 0a00 4e4f 626a 6563 7400 0000 0000 0000 0000 0000 0000 0000
1002400 0000 0000 0002 b114 0000 0000 0002 b3f0 0000 0000 0002 b14c 0000 0000 0002 b31c 0000 0000 0002 bc0c 0000 0000 0000 0000
1002460 0004 24f8 0003 d330 0003 d208 0003 d024 0003 cacc 0003 c8c8 0000 0000 0000 0000 0000 0000 0002 b494 0000 0000 0002 b6e4
1002540 0000 0000 0002 b6b4 0000 0000 0002 b680 0000 0000 0002 b658 0000 0000 0002 b630 0000 0000 0002 b604 0000 0000 0002 b5d4
1002620 0000 0000 0002 b5a4 0000 0000 0000 0000 0004 2548 0003 c660 0003 c510 0004 26ac 0003 db28 0003 dba0 0000 0000 0000 0000
1002700 0000 0000 0002 b52c 0000 0000 0002 b6e4 0000 0000 0000 0000 0004 25b8 0003 dab0 6c73 695f 6175 785f 636f 6d70 5f64 696d
1002760 0042 6164 2046 6966 6f20 7769 6474 6820 2d20 2564 0042 6164 2046 6966 6f20 7769 6474 6820 2d20 2564 0025 640a 2564 0a25
1003040 640a 2573 0a25 640a 2564 0a0a 710a 0020 0020 000a 004e 4f62 6a65 6374 0000 0000 434d 4f53 3130 4b00 4c43 4231 3500 4c43
1003120 4131 3030 4b00 4c43 4230 3037 0042 6164 2074 6563 686e 6f6c 6f67 7920 7479 7065 2066 6f72 204c 4253 202d 2025 7300 4261
1003200 6420 7465 6368 6e6f 6c6f 6779 2074 7970 6520 666f 7220 4d65 6d43 6f6d 7020 2d20 2573 0000 0000 0000 0000 0000 0000 0000
1003260 0000 0000 0000 0000 0002 c130 0000 0000 0002 c10c 0000 0000 0002 c0e8 0000 0000 0002 c0b8 0000 0000 0002 bc0c 0000 0000
1003340 0000 0000 0004 26ac 0003 db28 0003 dba0 0000 0000 0000 0000 0000 0000 0002 c150 0000 0000 0002 c1c8 0000 0000 0000 0000
1003420 0004 26f0 0003 dab0 4d6f 6447 656e 202d 0a00 5069 6e20 2573 2068 6173 2061 6c72 6561 6479 2062 6565 6e20 696e 7365 7274
1003500 6564 2069 6e20 5069 6e4c 656e 6774 6800 5069 6e20 2573 206e 6f74 2069 6e20 5069 6e4e 616d 654c 656e 6774 6800 7800 6e00
1003560 4361 6e6e 6f74 2068 616e 6465 6c20 636f 6d70 6c65 7820 6578 7072 7373 6e73 2066 6f72 2050 696e 4c65 6e67 7468 202d 2025
1003640 7300 0a00 4e4f 626a 6563 7400 0000 0000 0004 24f8 0004 2398 0004 2248 0004 1f88 0004 1da0 0004 1c40 0004 26ac 0003 db28
1003720 0003 dba0 0000 0000 0000 0000 0000 0000 0002 ccc8 0000 0000 0002 cd40 0000 0000 0000 0000 0004 27d4 0003 dab0 0000 0000
1004000 4c42 5300 4144 4445 5200 434f 554e 5445 5200 4d55 5800 4445 434f 4445 5200 4449 4e43 5245 4d45 4e54 4f52 0046 4946 4f00
1004060 4d65 6d43 6f6d 7000 4261 6420 636f 6d70 6f6e 656e 7420 7479 7065 2028 2573 2920 666f 7220 4d47 2028 2573 2900 4261 6420
1004140 636f 6d70 6f6e 656e 7420 7479 7065 2028 2573 2920 666f 7220 4d47 2028 2573 2900 0a00 4e4f 626a 6563 7400 0000 0000 0000
1004220 2448 6561 6465 723a 2076 7072 696e 7466 2e63 2c76 2031 302e 302e 302e 3020 3839 2f30 362f 3237 2031 363a 3035 3a31 3920
1004300 6f70 6975 6d21 746f 6f6c 6c69 6220 546f 6f6c 6c69 6220 2400 2564 696f 7578 5863 7366 6545 6747 000a 7666 7072 696e 7466
1004360 3a20 6275 6666 6572 206f 7665 7266 6c6f 772e 0a00 2564 696f 7578 5863 7366 6545 6747 000a 7673 7072 696e 7466 3a20 6275
1004440 6666 6572 206f 7665 7266 6c6f 772e 0a00 2448 6561 6465 723a 2065 6873 7461 636b 2e63 2c76 2031 302e 302e 302e 3020 3839
1004520 2f30 362f 3237 2031 363a 3035 3a35 3620 6f70 6975 6d21 746f 6f6c 6c69 6220 546f 6f6c 6c69 6220 2400 2448 6561 6465 723a
1004600 206d 6c2e 682c 7620 3130 2e30 2e30 2e30 2038 392f 3036 2f32 3720 3136 3a30 353a 3335 206f 7069 756d 2174 6f6f 6c6c 6962
1004660 2054 6f6f 6c6c 6962 2024 0000 2448 6561 6465 723a 2065 682e 682c 7620 3130 2e30 2e30 2e30 2038 392f 3036 2f32 3720 3136
1004740 3a30 353a 3438 206f 7069 756d 2174 6f6f 6c6c 6962 2054 6f6f 6c6c 6962 2024 0000 0000 0000 0000 0000 732d 3032 2f65 6873
1005020 7461 636b 2e63 0073 2d30 322f 6568 7374 6163 6b2e 6300 0000 2448 6561 6465 723a 2065 6874 6162 6c65 2e63 2c76 2031 302e
1005100 302e 302e 3020 3839 2f30 362f 3237 2031 363a 3036 3a30 3120 6f70 6975 6d21 746f 6f6c 6c69 6220 546f 6f6c 6c69 6220 2400
1005160 2448 6561 6465 723a 206d 6c2e 682c 7620 3130 2e30 2e30 2e30 2038 392f 3036 2f32 3720 3136 3a30 353a 3335 206f 7069 756d
1005240 2174 6f6f 6c6c 6962 2054 6f6f 6c6c 6962 2024 0000 2448 6561 6465 723a 2065 682e 682c 7620 3130 2e30 2e30 2e30 2038 392f
1005320 3036 2f32 3720 3136 3a30 353a 3438 206f 7069 756d 2174 6f6f 6c6c 6962 2054 6f6f 6c6c 6962 2024 0000 2448 6561 6465 723a
1005400 2065 6874 6162 6c65 2e68 2c76 2031 302e 302e 302e 3020 3839 2f30 362f 3237 2031 363a 3036 3a30 3520 6f70 6975 6d21 746f
1005460 6f6c 6c69 6220 546f 6f6c 6c69 6220 2400 0004 2bd8 0004 2bff 0004 2c28 0004 2c40 0004 2c5d 0004 2c7b 0004 2c9c 0004 2cd2
```

```
1005540  0004 2cf7 0004 2d2e 0004 2d63 0004 2d8e 0004 2db7 0004 2de5 0004 2e0c 0004 2e36 0004 2e6c 0004 2e91 0004 2eb9 0004 2eed
1005620  0004 2f1a 0004 2f3e 0004 2f5f 0004 2f60 0004 2f89 0004 2faa 0004 2fd0 0004 2ffe 0004 302f 0004 304f 0004 3050 0004 3069
1005700  0004 3092 0004 30bb 0004 30f4 ffff ffff 0000 0000 0000 0000 0a25 7328 2564 293a 2065 7863 6570 7469 6f6e 2027 2564 2720
1005760  6e6f 7420 6465 636c 6172 6564 2e0a 000a 2573 2825 6429 3a20 656d 7074 7920 6578 6365 7074 696f 6e20 6861 6e64 6c65 7220
1006040  7374 6163 6b2e 0a00 0a25 7328 2564 293a 2063 7261 7368 2066 6f72 6365 642e 0a00 0a25 7328 2564 293a 2061 7373 6572 7469
1006120  6f6e 2062 6f74 6368 6564 2e0a 000a 6d61 5f63 7572 7265 6e74 5f67 726f 7570 3a20 6e6f 2067 726f 7570 2e0a 000a 6d61 5f70
1006200  7573 685f 6772 6f75 703a 2073 7461 636b 206f 7665 7266 6c6f 772e 0a00 0a76 6572 6966 795f 6772 6f75 705f 7374 6163 6b5f
1006260  6772 6f75 703a 2062 6164 2067 726f 7570 2069 6e20 6772 6f75 7020 7374 6163 6b2e 0a00 0a6d 615f 7665 7269 6679 5f67 726f
1006340  7570 3a20 6261 6420 6772 6f75 7020 7061 7373 6564 2e0a 000a 6d61 5f76 6572 6966 795f 6772 6f75 703a 206d 656d 6f72 7920
1006420  6772 6f75 7020 6265 6769 6e20 6d61 6769 6320 7669 6f6c 6174 696f 6e2e 0a00 0a6d 615f 7665 7269 6679 5f67 726f 7570 3a20
1006500  6d65 6d6f 7279 2067 726f 7570 2065 6e64 206d 6167 6963 2076 696f 6c61 7469 6f6e 2e0a 000a 6d65 6d6f 7279 206f 7665 7220
1006560  6465 7465 6374 6564 3a20 7061 6420 6265 6769 6e20 636f 7272 7570 742e 0a00 0a6d 656d 6f72 7920 6f76 6572 2064 6574 6563
1006640  7465 643a 2070 6164 2065 6e64 2063 6f72 7275 7074 2e0a 000a 6d65 6d6f 7279 206f 7665 7220 6465 7465 6374 6564 3a20 7061
1006720  6420 706f 696e 7465 7273 2063 6f72 7275 7074 2e0a 000a 7665 7269 6679 5f73 6d61 6c6c 5f66 7265 655f 626c 6f63 6b3a 2073
1007000  697a 6520 7772 6f6e 672e 0a00 0a76 6572 6966 795f 736d 616c 6c5f 6672 6565 5f62 6c6f 636b 3a20 696e 6669 6e69 7465 206c
1007060  6f6f 702e 0a00 0a76 6572 6966 795f 736d 616c 6c5f 6672 6565 5f62 6c6f 636b 3a20 6672 6565 2062 6c6f 636b 2069 6e20 7772
1007140  6f6e 6720 6772 6f75 702e 0a00 0a76 6572 6966 795f 6269 675f 6672 6565 5f62 6c6f 636b 3a20 7369 7a65 2077 726f 6e67 2e0a
1007220  000a 7665 7269 6679 5f62 6967 5f66 7265 655f 626c 6f63 6b3a 2069 6e66 696e 6974 6520 6c6f 6f70 2e0a 000a 7665 7269 6679
1007300  5f62 6967 5f66 7265 655f 626c 6f63 6b3a 2066 7265 6520 626c 6f63 6b20 696e 2077 726f 6e67 2067 726f 7570 2e0a 000a 6d61
1007360  5f73 7973 7465 6d5f 616c 6c6f 633a 2063 616e 6e6f 7420 616c 6c6f 6361 7465 2025 6420 6279 7465 732e 0a00 0a25 7328 2564
1007440  293a 2063 616e 6e6f 7420 616c 6c6f 6361 7465 2025 6420 6279 7465 732e 0a00 0a6d 615f 706f 705f 6772 6f75 703a 2073 7461
1007520  636b 2075 6e64 6572 666c 6f77 2e0a 0000 0a6d 615f 6672 6565 3a20 706f 696e 7465 7220 2578 2069 7320 6e6f 7420 6672 6f6d
1007600  2067 726f 7570 2e0a 000a 6874 5f76 6572 6966 793a 206d 6167 6963 206e 756d 6265 7220 6572 726f 722e 0a00 0a68 745f 7665
1007660  7269 6679 3a20 7461 626c 6527 7320 6772 6f75 7020 6973 2069 6e76 616c 642e 0a00 0a68 745f 7665 7269 6679 3a20 7461 626c
1007740  6520 6973 6e27 7420 696e 2069 7473 206d 656d 6f72 7920 6772 6f75 702e 0a00 0a68 745f 7665 7269 6679 3a20 7061 7373 6564
1010020  2074 6162 6c65 2069 736e 2774 2061 2076 616c 6964 2070 6f69 6e74 6572 2e0a 000a 2573 3a20 7061 7373 6564 2074 6162 6c65
1010100  2069 736e 2774 2076 616c 6964 2e0a 0000 0a25 7328 2564 293a 2062 6164 2074 6162 6c65 2825 5829 2e0a 000a 2573 2825 6429
1010160  3a20 7461 626c 6528 2558 2920 6861 7320 6261 6420 726f 7574 696e 6528 2558 292e 0a00 0a25 7328 2564 293a 2074 6162 6c65
1010240  2825 5829 2068 6173 2062 6164 2065 6c65 6d65 6e74 2825 5829 2e0a 000a 2573 2825 6429 3a20 7461 626c 6528 2558 2920 6861
1010320  7320 656c 656d 656e 7428 2558 2920 7769 7468 2062 6164 206e 6f74 6966 7928 2558 292e 0a00 0073 2d30 322f 6568 7461 626c
1010400  652e 6300 0073 2d30 322f 6568 7461 626c 652e 6300 732d 3032 2f65 6874 6162 6c65 2e63 0073 2d30 322f 6568 7461 626c 652e
1010460  6300 0000 0000 0000 2448 6561 6465 723a 206d 612e 632c 7620 3130 2e30 2e30 2e30 2038 392f 3036 2f32 3720 3136 3a30 363a
1010540  3132 206f 7069 756d 2174 6f6f 6c6c 6962 2054 6f6f 6c6c 6962 2024 0000 2448 6561 6465 723a 206d 6c2e 682c 7620 3130 2e30
1010620  2e30 2e30 2038 392f 3036 2f32 3720 3136 3a30 353a 3335 206f 7069 756d 2174 6f6f 6c6c 6962 2054 6f6f 6c6c 6962 2024 0000
1010700  2448 6561 6465 723a 2065 682e 632c 7620 3130 2e30 2e30 2e30 2038 392f 3036 2f32 3720 3136 3a30 353a 3438 206f 7069 756d
1010760  2174 6f6f 6c6c 6962 2054 6f6f 6c6c 6962 2024 0000 2448 6561 6465 723a 206d 612e 682c 7620 3130 2e30 2e30 2e30 2038 392f
1011040  3036 2f32 3720 3136 3a30 363a 3138 206f 7069 756d 2174 6f6f 6c6c 6962 2054 6f6f 6c6c 6962 2024 0000 2448 6561 6465 723a
1011120  206d 615f 696e 742e 682c 7620 3130 2e30 2e30 2e30 2038 392f 3036 2f32 3720 3136 3a30 363a 3237 206f 7069 756d 2174 6f6f
1011200  6c6c 6962 2054 6f6f 6c6c 6962 2024 0000 0000 0000 0000 0000 0000 0000 0000 0000 0000 0000 0000 0000 0000 0000 0000 0000
1011260  0000 0000 0000 0000 0000 0000 0000 0000 0000 0000 0000 0000 0000 0000 0000 0000 0000 0000 0000 0000 0000 0000 0000 0000
*
1012060  0000 0000 0000 0000 0000 0000 0000 0000 0000 0000 58b2 c29d 0000 0000 0000 0000 0000 0000 0000 0000 0000 0000 0000 0000
1012140  0000 0000 0000 0000 0000 1ff9 0000 0000 0000 0000 0004 32b0 0002 ffe0 0002 fd44 0002 f7f4 0000 0000 81c1 02bf 0004 3444
1012220  0004 3444 0000 0000 0004 3444 0000 0000 0000 0000 0000 0000 0000 0000 0000 0000 0000 0000 0000 0000 0000 0000 0000 0000
1012300  0000 0000 0000 0000 0000 0000 0000 0000 0000 0000 0000 0000 0000 0000 0000 0000 0000 0000 0000 0000 0000 0000 0000 0000
*
1051400  0000 0000 0000 0000 0000 0000 0000 0000 0000 0000 0000 0000 284e 554c 4c29 0073 2d30 332f 6d61 2e63 0073 2d30 332f 6d61
1051460  2e63 0073 2d30 332f 6d61 2e63 0000 0000 2448 6561 6465 723a 206d 616e 662e 632c 7620 3130 2e30 2e30 2e30 2038 392f 3036
1051540  2f32 3720 3136 3a30 363a 3336 206f 7069 756d 2174 6f6f 6c6c 6962 2054 6f6f 6c6c 6962 2024 0000 0000 2448 6561 6465 723a
1051620  206d 6c2e 682c 7620 3130 2e30 2e30 2e30 2038 392f 3036 2f32 3720 3136 3a30 353a 3335 206f 7069 756d 2174 6f6f 6c6c 6962
1051700  2054 6f6f 6c6c 6962 2024 0000 2448 6561 6465 723a 2065 682e 682c 7620 3130 2e30 2e30 2e30 2038 392f 3036 2f32 3720 3136
1051760  3a30 353a 3438 206f 7069 756d 2174 6f6f 6c6c 6962 2054 6f6f 6c6c 6962 2024 0000 2448 6561 6465 723a 206d 612e 682c 7620
1052040  3130 2e30 2e30 2e30 2038 392f 3036 2f32 3720 3136 3a30 363a 3138 206f 7069 756d 2174 6f6f 6c6c 6962 2054 6f6f 6c6c 6962
1052120  2024 0000 2448 6561 6465 723a 206d 615f 696e 742e 682c 7620 3130 2e30 2e30 2e30 2038 392f 3036 2f32 3720 3136 3a30 363a
1052200  3237 206f 7069 756d 2174 6f6f 6c6c 6962 2054 6f6f 6c6c 6962 2024 0000 0000 0000 2448 6561 6465 723a 206d 6167 662e 632c
```

```
1052260 7620 3130 2e30 2e30 2e30 2038 392f 3036 2f32 3720 3136 3a30 363a 3331 206f 7069 756d 2174 6f6f 6c6c 6962 2054 6f6f 6c6c
1052340 6962 2024 0000 0000 2448 6561 6465 723a 206d 6c2e 682c 7620 3130 2e30 2e30 2e30 2038 392f 3036 2f32 3720 3136 3a30 353a
1052420 3335 206f 7069 756d 2174 6f6f 6c6c 6962 2054 6f6f 6c6c 6962 2024 0000 2448 6561 6465 723a 2065 682e 682c 7620 3130 2e30
1052500 2e30 2e30 2038 392f 3036 2f32 3720 3136 3a30 353a 3438 206f 7069 756d 2174 6f6f 6c6c 6962 2054 6f6f 6c6c 6962 2024 0000
1052560 2448 6561 6465 723a 206d 612e 682c 7620 3130 2e30 2e30 2e30 2038 392f 3036 2f32 3720 3136 3a30 363a 3138 206f 7069 756d
1052640 2174 6f6f 6c6c 6962 2054 6f6f 6c6c 6962 2024 0000 2448 6561 6465 723a 206d 615f 696e 742e 682c 7620 3130 2e30 2e30 2e30
1052720 2038 392f 3036 2f32 3720 3136 3a30 363a 3237 206f 7069 756d 2174 6f6f 6c6c 6962 2054 6f6f 6c6c 6962 2024 0000 0000 0000
1053000 2448 6561 6465 723a 2065 682e 682c 7620 3130 2e30 2e30 2e30 2038 392f 3036 2f32 3720 3136 3a30 353a 3438 206f 7069 756d
1053060 2174 6f6f 6c6c 6962 2054 6f6f 6c6c 6962 2024 0000 2448 6561 6465 723a 206d 612e 682c 7620 3130 2e30 2e30 2e30 2038 392f
1053140 3036 2f32 3720 3136 3a30 363a 3138 206f 7069 756d 2174 6f6f 6c6c 6962 2054 6f6f 6c6c 6962 2024 0000 2448 6561 6465 723a
1053220 2073 742e 682c 7620 3130 2e30 2e30 2e30 2038 392f 3036 2f32 3720 3136 3a30 363a 3530 206f 7069 756d 2174 6f6f 6c6c 6962
1053300 2054 6f6f 6c6c 6962 2024 0000 2448 6561 6465 723a 2068 742e 632c 7620 3130 2e30 2e30 2e30 2038 392f 3036 2f32 3720 3136
1053360 3a30 383a 3132 206f 7069 756d 2174 6f6f 6c6c 6962 2054 6f6f 6c6c 6962 2024 0000 6874 5f69 735f 656c 656d 656e 7400 6874
1053440 5f67 6574 5f65 6c65 6d65 6e74 0068 745f 696e 7365 7274 5f65 6c65 6d65 6e74 0068 745f 7265 706c 6163 655f 656c 656d 656e
1053520 7400 6874 5f64 656c 6574 655f 656c 656d 656e 7400 6874 5f67 6574 5f6e 6578 745f 656c 656d 656e 7400 6874 5f67 6574 5f63
1053600 6f75 6e74 0000 0000 2448 6561 6465 723a 206d 6c2e 632c 7620 3130 2e30 2e30 2e30 2038 392f 3036 2f32 3720 3136 3a30 353a
1053660 3236 206f 7069 756d 2174 6f6f 6c6c 6962 2054 6f6f 6c6c 6962 2024 0000 2448 6561 6465 723a 206d 6c2e 682c 7620 3130 2e30
1053740 2e30 2e30 2038 392f 3036 2f32 3720 3136 3a30 353a 3335 206f 7069 756d 2174 6f6f 6c6c 6962 2054 6f6f 6c6c 6962 2024 0000
1054020 2448 6561 6465 723a 2065 682e 682c 7620 3130 2e30 2e30 2e30 2038 392f 3036 2f32 3720 3136 3a30 353a 3438 206f 7069 756d
1054100 2174 6f6f 6c6c 6962 2054 6f6f 6c6c 6962 2024 0000 2448 6561 6465 723a 206d 612e 682c 7620 3130 2e30 2e30 2e30 2038 392f
1054160 3036 2f32 3720 3136 3a30 363a 3138 206f 7069 756d 2174 6f6f 6c6c 6962 2054 6f6f 6c6c 6962 2024 0000 2448 6561 6465 723a
1054240 2073 742e 682c 7620 3130 2e30 2e30 2e30 2038 392f 3036 2f32 3720 3136 3a30 363a 3530 206f 7069 756d 2174 6f6f 6c6c 6962
1054320 2054 6f6f 6c6c 6962 2024 0000 2448 6561 6465 723a 2073 742e 632c 7620 3130 2e30 2e30 2e30 2038 392f 3036 2f32 3720 3136
1054400 3a30 363a 3432 206f 7069 756d 2174 6f6f 6c6c 6962 2054 6f6f 6c6c 6962 2024 0000 4161 4262 4363 4464 4565 4666 4767 4868
1054460 4969 4a6a 4b6b 4c6c 4d6d 4e6e 4f6f 5070 5171 5272 5373 5474 5575 5676 5777 5878 5979 5a7a 0000 0000 2009 0d0a 0b0c 0000
1054540 3031 3233 3435 3637 3839 0000 0000 0000 0000 0000 0000 0000 0000 0000 0000 0000 0000 0000 0000 0000 0000 01a4 0000 000e
1054620 0000 1800 0000 0070 0020 2020 2020 2020 2020 2828 2828 2820 2020 2020 2020 2020 2020 2020 2020 2020 2088 1010 1010 1010
1054700 1010 1010 1010 1010 1044 4444 4444 4444 4444 4410 1010 1010 1010 4141 4141 4141 0101 0101 0101 0101 0101 0101 0101 0101
1054760 0101 0101 1010 1010 1010 4242 4242 4242 0202 0202 0202 0202 0202 0202 0202 0202 0202 0202 1010 1010 2000 0000 0000 0000
1055040 0000 0000 0000 0000 0000 0000 0000 0000 0000 0000 0000 0000 0000 0000 0000 0000 0000 0000 0000 0000 0000 0000 0000 0000
*
1055260 0001 0000 0000 0000 0000 0000 0000 0000 0000 0000 0002 0100 0000 0000 0000 0000 0000 0000 0000 0000 0006 0200 0000 0000
1055340 0000 0000 0000 0000 0000 0000 0000 0000 0000 0000 0000 0000 0000 0000 0000 0000 0000 0000 0000 0000 0000 0000 0000 0000
*
1057760 0000 0000 0000 0000 0000 0000 0000 0000 0000 0004 0600 0000 0003 c000 0000 000e 0400 0000 0000 2020 0000 0015 0400 0000
1060040 0000 2288 0000 0023 0400 0000 0000 2288 0000 002b 0400 0000 0000 2288 0000 003c 0800 0000 0004 9278 0000 004b 6400 0000
1060120 0000 2288 0000 007b 6400 0000 0000 2288 0000 0083 8400 0000 0000 2288 0000 008d 8000 0000 0000 0000 0000 00b7 8000 0000
1060200 0000 0000 0000 00d1 8000 0000 0000 0000 0000 00fc 8000 0000 0000 0000 0000 011e 8000 0000 0000 0000 0000 0141 8000 0000
1060260 0000 0000 0000 0167 8000 0000 0000 0000 0000 0189 8000 0000 0000 0000 0000 01aa 8000 0000 0000 0000 0000 01c3 8000 0000
1060340 0000 0000 0000 01de 8000 0000 0000 0000 0000 01f2 8000 0000 0000 0000 0000 0204 8000 0004 ffff fb05 0000 0222 8000 0008
1060420 ffff fb05 0000 025f 8000 0001 ffff fb05 0000 027c 8000 0004 ffff fb05 0000 028a 8000 0004 ffff fb05 0000 029b 800c 0004
1060500 ffff fb05 0000 02ac 8000 0004 ffff fb05 0000 0323 8000 0004 ffff fb05 0000 03bb 8000 0004 ffff fb05 0000 03ff 8000 0004
1060560 ffff fb05 0000 047f 8000 0004 ffff fb05 0000 04f9 8000 0004 ffff fb05 0000 0527 8000 003c ffff fb05 0000 063e 8000 003c
1060640 ffff fb05 0000 073a 2000 0004 0000 0000 0000 0751 2000 0004 0000 0000 0000 076a 2000 0004 0000 0000 0000 0782 2000 0004
1060720 0000 0000 0000 0797 2000 0004 0000 0000 0000 07ad 2000 0001 0000 0000 0000 07c6 8000 0000 0000 0000 0000 088c 8000 0000
1061000 0000 0000 0000 0952 8000 0000 0000 0000 0000 0a12 8000 0000 0000 0000 0000 0a66 8000 0028 ffff fb05 0000 0b87 8000 0028
1061060 ffff fb05 0000 0bec 8000 0000 0000 0000 0000 0cb7 8000 0000 0000 0000 0000 0d82 8000 0000 0000 0000 0000 0e40 8000 0000
1061140 0000 0000 0000 0f04 8000 0000 0000 0000 0000 0fc9 8000 0000 0000 0000 0000 1028 8000 0048 ffff fb05 0000 10a6 8000 0000
1061220 0000 0000 0000 116a 8000 0000 0000 0000 0000 1234 8000 0000 0000 0000 0000 1309 8000 0000 0000 0000 0000 13d5 8000 0000
1061300 0000 0000 0000 1473 8000 0044 ffff fb05 0000 14ca 8000 0000 0000 0000 0000 1590 8000 0000 0000 0000 0000 165b 8000 0000
1061360 0000 0000 0000 1728 8000 0000 0000 0000 0000 176a 2400 0044 0000 2288 0000 178a a000 0044 0000 0044 0000 179a a000 0001
1061440 0000 0048 0000 17a6 8400 0000 0000 2288 0000 0000 4400 01d1 0000 2288 0000 17c3 4000 0044 0000 0018 0000 0000 4400 01d1
1061520 0000 2298 0000 17d3 8000 0000 0000 0000 0000 17e0 8000 0000 0000 0000 0000 0000 4400 01d2 0000 2298 0000 0000 4400 01d3
1061600 0000 22cc 0000 0000 4400 01d4 0000 2370 0000 0000 4400 01d6 0000 23a0 0000 0000 4400 01d8 0000 23d0 0000 0000 4400 01d9
1061660 0000 23dc 0000 17ea 8000 0000 0000 0000 0000 17ff 8000 0050 ffff fb05 0000 187a 8000 0000 0000 0000 0000 1901 2000 0000
```

```
1061740 0000 0000 0000 1923 2000 0000 0000 0000 0000 1946 2000 0000 0000 0000 0000 1953 2000 0000 0000 0000 0000 1960 8000 0001
1062020 ffff fb05 0000 199a 2000 0004 0000 0000 0000 19bc 2000 0004 0000 0000 0000 19de 8000 0000 0000 0000 0000 1a6b 2800 0001
1062100 0004 9278 0000 1a81 8000 0004 ffff fb05 0000 1a8d 8000 0008 ffff fb05 0000 1af0 8000 0000 0000 0000 0000 1b6c 8000 0004
1062160 ffff fb05 0000 1ba1 8000 0000 0000 0000 0000 1bf5 8000 0008 ffff fb05 0000 1c60 8000 0000 0000 0000 0000 1cc6 8000 0004
1062240 ffff fb05 0000 1cfb 8000 0000 0000 0000 0000 1d57 8000 0008 ffff fb05 0000 1dba 8000 0000 0000 0000 0000 1e20 8000 0004
1062320 ffff fb05 0000 1e55 8000 0000 0000 0000 0000 1eb1 8000 0008 ffff fb05 0000 1f1f 8000 0000 0000 0000 0000 1fac 8000 0004
1062400 ffff fb05 0000 1fe3 8000 0000 0000 0000 0000 2045 8000 0008 ffff fb05 0000 209b 8000 0000 0000 0000 0000 211c 8000 0004
1062460 ffff fb05 0000 2153 8000 0000 0000 0000 0000 21ab 8000 0008 ffff fb05 0000 2201 8000 0000 0000 0000 0000 226b 8000 0004
1062540 ffff fb05 0000 22a2 8000 0000 0000 0000 0000 2302 8000 0008 ffff fb05 0000 2358 8000 0000 0000 0000 0000 23c2 8000 0004
1062620 ffff fb05 0000 23f9 8000 0000 0000 0000 0000 2459 8000 0008 ffff fb05 0000 24b2 8000 0000 0000 0000 0000 2544 8000 0004
1062700 ffff fb05 0000 257d 8000 0000 0000 0000 0000 25e3 2000 0004 0000 0000 0000 25f0 2000 0004 0000 0000 0000 2600 8000 0034
1062760 ffff fb05 0000 2719 8000 0034 ffff fb05 0000 27fb 8000 0000 0000 0000 0000 28c5 8000 0000 0000 0000 0000 28f2 8000 0040
1063040 ffff fb05 0000 2a0a 8000 0040 ffff fb05 0000 2b24 2000 0004 0000 0000 0000 2b3e 8000 0000 0000 0000 0000 2c0b 8000 0000
1063120 0000 0000 0000 2cb6 8000 0084 ffff fb05 0000 2d3b 8000 0000 0000 0000 0000 2e10 8000 0000 0000 0000 0000 2e8c 8000 0004
1063200 ffff fb05 0000 2ea0 8000 0004 ffff fb05 0000 2edc 8000 0004 ffff fb05 0000 2f1d 8000 0004 ffff fb05 0000 2f5b 8000 0004
1063260 ffff fb05 0000 2f96 8000 0004 ffff fb05 0000 2fd4 8000 0004 ffff fb05 0000 2ff6 8000 0004 ffff fb05 0000 3018 2000 0001
1063340 0000 0000 0000 3027 8000 0024 ffff fb05 0000 3174 8000 0000 0000 0000 0000 3234 8000 0000 0000 0000 0000 32c8 2000 0001
1063420 0000 0000 0000 32ee 2000 0001 0000 0000 0000 3301 2000 0001 0000 0000 0000 3314 2000 0001 0000 0000 0000 3322 8400 0000
1063500 0000 23ec 0000 332c 2000 0001 0000 0000 0000 333b 2000 0001 0000 0000 0000 334a 2400 0024 0000 23ec 0000 3370 a000 0024
1063560 0000 0044 0000 3380 a000 0001 0000 0048 0000 0000 4400 0011 0000 23ec 0000 3391 4000 0024 0000 0018 0000 0000 4400 0011
1063640 0000 23fc 0000 33a1 8000 0001 ffff fffc 0000 0000 c000 0002 0000 0174 0000 33b1 8000 0000 0000 0000 0000 0000 4400 0013
1063720 0000 23fc 0000 33be 8000 0000 0000 0000 0000 0000 4400 0014 0000 23fc 0000 33cc 8000 0000 0000 0000 0000 0000 4400 0015
1064000 0000 23fc 0000 0000 4400 0011 0000 23fc 0000 0000 4400 0012 0000 2424 0000 0000 4400 0014 0000 2434 0000 0000 4400 0015
1064060 0000 2444 0000 0000 4400 0016 0000 2468 0000 0000 4400 0017 0000 2484 0000 0000 4400 001a 0000 2490 0000 0000 4400 001b
1064140 0000 24a8 0000 0000 4400 001c 0000 24b8 0000 0000 4400 001d 0000 24dc 0000 0000 4400 001e 0000 24f8 0000 0000 4400 0021
1064220 0000 2504 0000 0000 4400 0022 0000 251c 0000 0000 4400 0023 0000 252c 0000 0000 4400 0025 0000 2550 0000 0000 4400 0026
1064300 0000 256c 0000 0000 4400 0029 0000 2578 0000 0000 4400 002a 0000 2590 0000 0000 4400 002b 0000 25a0 0000 0000 4400 002d
1064360 0000 25c4 0000 0000 4400 002e 0000 25e0 0000 0000 4400 0031 0000 25ec 0000 0000 4400 0032 0000 25f4 0000 0000 e000 0002
1064440 0000 0378 0000 0000 4400 0033 0000 2600 0000 33da 8000 0000 0000 0000 0000 33f5 2400 0004 0000 2610 0000 3414 a000 0024
1064520 0000 0044 0000 0000 4400 0036 0000 2610 0000 3424 4000 0024 0000 0018 0000 0000 4400 0036 0000 261c 0000 3434 8000 0000
1064600 0000 0000 0000 0000 4400 0037 0000 261c 0000 0000 4400 0038 0000 264c 0000 0000 4400 003a 0000 2658 0000 0000 4400 003b
1064660 0000 2664 0000 3441 8000 0000 0000 0000 0000 345e 2400 0001 0000 2674 0000 3483 a000 0024 0000 0044 0000 0000 4400 003f
1064740 0000 2674 0000 3493 4000 0024 0000 0018 0000 0000 4400 003f 0000 2680 0000 34a3 8000 0001 ffff fffc 0000 0000 c000 0002
1065020 0000 03f8 0000 34ba 8000 0000 0000 0000 0000 0000 4400 0040 0000 2680 0000 34c7 8000 0000 0000 0000 0000 0000 4400 0041
1065100 0000 2680 0000 0000 4400 0040 0000 2680 0000 0000 4400 0041 0000 26a4 0000 0000 4400 0042 0000 26b0 0000 0000 e000 0002
1065160 0000 0454 0000 0000 4400 0044 0000 26dc 0000 34dc 8000 0000 0000 0000 0000 34ff 2400 0004 0000 26ec 0000 3525 a000 0024
1065240 0000 0044 0000 3535 a000 0004 0000 0048 0000 0000 4400 0049 0000 26ec 0000 3544 4000 0024 0000 0018 0000 0000 4400 0049
1065320 0000 26fc 0000 3554 8000 0004 ffff fffc 0000 355f 8000 0001 ffff fff8 0000 0000 c000 0002 0000 0474 0000 3576 8000 0000
1065400 0000 0000 0000 0000 4400 0051 0000 26fc 0000 3583 8000 0000 0000 0000 0000 0000 4400 0052 0000 26fc 0000 3590 8000 0000
1065460 0000 0000 0000 0000 4400 0053 0000 26fc 0000 359a 8000 0000 0000 0000 0000 0000 4400 0054 0000 26fc 0000 0000 4400 004b
1065540 0000 26fc 0000 0000 4400 004c 0000 271c 0000 0000 4400 004d 0000 2730 0000 0000 4400 004f 0000 2750 0000 0000 4400 0051
1065620 0000 2760 0000 0000 4400 0052 0000 2770 0000 0000 4400 0053 0000 2790 0000 0000 4400 0054 0000 27a4 0000 0000 4400 0055
1065700 0000 27bc 0000 0000 4400 0056 0000 27cc 0000 0000 4400 0059 0000 27d8 0000 0000 4400 005a 0000 27fc 0000 0000 4400 005b
1065760 0000 2808 0000 0000 4400 005e 0000 281c 0000 0000 e000 0002 0000 05a0 0000 0000 4400 005f 0000 2828 0000 35af 8000 0000
1066040 0000 0000 0000 35d3 2400 0004 0000 2838 0000 35fc a000 0024 0000 0044 0000 360c a000 0001 0000 0048 0000 3619 a000 0001
1066120 0000 004c 0000 0000 4400 0063 0000 2838 0000 0000 4400 0063 0000 2850 0000 362d 8000 0000 0000 0000 0000 363a 8000 0000
1066200 0000 0000 0000 0000 4400 0064 0000 2850 0000 3644 8000 0000 0000 0000 0000 0000 4400 0065 0000 2850 0000 0000 4400 0064
1066260 0000 2850 0000 0000 4400 0065 0000 2870 0000 3655 8000 0000 0000 0000 0000 367c 2400 0004 0000 2880 0000 36a4 a000 0024
1066340 0000 0044 0000 36b4 a000 0001 0000 0048 0000 36c1 a000 0001 0000 004c 0000 0000 4400 0069 0000 2880 0000 0000 4400 0069
1066420 0000 2898 0000 36d5 8000 0000 0000 0000 0000 36e2 8000 0000 0000 0000 0000 0000 4400 006a 0000 2898 0000 36ec 8000 0000
1066500 0000 0000 0000 0000 4400 006b 0000 2898 0000 0000 4400 006a 0000 2898 0000 0000 4400 006b 0000 28b8 0000 36fd 8000 0000
1066560 0000 0000 0000 3723 2400 0004 0000 28c8 0000 374f a000 0024 0000 0044 0000 375f a000 0001 0000 0048 0000 376f a000 0001
1066640 0000 004c 0000 3783 a000 0004 0000 0050 0000 0000 4400 0070 0000 28c8 0000 3796 4000 0024 0000 0018 0000 0000 4400 0070
1066720 0000 28e0 0000 37a6 8000 0004 ffff fffc 0000 37b1 8000 0001 ffff fff6 0000 37be 8000 0001 ffff fff4 0000 37d1 8000 0001
1067000 ffff fff0 0000 37e5 8000 0001 ffff ffec 0000 0000 c000 0002 0000 0658 0000 37fc 8000 0000 0000 0000 0000 0000 4400 0077
```

| | | | | | | | | | | | | | | | | | | | | | | | | |
|---|---|---|---|---|---|---|---|---|---|---|---|---|---|---|---|---|---|---|---|---|---|---|---|---|
| 1067060 | 0000 | 28e0 | 0000 | 3809 | 8000 | 0000 | 0000 | 0000 | 0000 | 0000 | 4400 | 0078 | 0000 | 28e0 | 0000 | 3816 | 8000 | 0000 | 0000 | 0000 | 0000 | 0000 | 4400 | 0079 |
| 1067140 | 0000 | 28e0 | 0000 | 3827 | 8000 | 0000 | 0000 | 0000 | 0000 | 0000 | 4400 | 007a | 0000 | 28e0 | 0000 | 3838 | 8000 | 0000 | 0000 | 0000 | 0000 | 0000 | 4400 | 007b |
| 1067220 | 0000 | 28e0 | 0000 | 3842 | 8000 | 0000 | 0000 | 0000 | 0000 | 0000 | 4400 | 007c | 0000 | 28e0 | 0000 | 384d | 8000 | 0000 | 0000 | 0000 | 0000 | 0000 | 4400 | 007d |
| 1067300 | 0000 | 28e0 | 0000 | 395e | 8000 | 0000 | 0000 | 0000 | 0000 | 0000 | 4400 | 007e | 0000 | 28e0 | 0000 | 3870 | 8000 | 0000 | 0000 | 0000 | 0000 | 0000 | 4400 | 007f |
| 1067360 | 0000 | 28e0 | 0000 | 0000 | 4400 | 0072 | 0000 | 28e0 | 0000 | 0000 | 4400 | 0073 | 0000 | 28e4 | 0000 | 0000 | 4400 | 0074 | 0000 | 28f0 | 0000 | 0000 | 4400 | 0075 |
| 1067440 | 0000 | 28fc | 0000 | 0000 | 4400 | 0077 | 0000 | 2908 | 0000 | 0000 | 4400 | 0079 | 0000 | 2938 | 0000 | 0000 | 4400 | 007a | 0000 | 2940 | 0000 | 0000 | 4400 | 007c |
| 1067520 | 0000 | 2948 | 0000 | 0000 | 4400 | 007d | 0000 | 296c | 0000 | 0000 | 4400 | 007e | 0000 | 2978 | 0000 | 0000 | 4400 | 007f | 0000 | 298c | 0000 | 0000 | 4400 | 0083 |
| 1067600 | 0000 | 29ac | 0000 | 0000 | 4400 | 0084 | 0000 | 29bc | 0000 | 0000 | 4400 | 0088 | 0000 | 29e8 | 0000 | 0000 | 4400 | 0089 | 0000 | 2a18 | 0000 | 0000 | 4400 | 008a |
| 1067660 | 0000 | 2a40 | 0000 | 0000 | 4400 | 008b | 0000 | 2a50 | 0000 | 0000 | 4400 | 008c | 0000 | 2a98 | 0000 | 0000 | 4400 | 008e | 0000 | 2ad8 | 0000 | 0000 | 4400 | 0091 |
| 1067740 | 0000 | 2ae4 | 0000 | 0000 | 4400 | 0092 | 0000 | 2af4 | 0000 | 0000 | 4400 | 0093 | 0000 | 2b34 | 0000 | 0000 | 4400 | 0094 | 0000 | 2b74 | 0000 | 0000 | 4400 | 009a |
| 1070020 | 0000 | 2bb8 | 0000 | 0000 | 4400 | 009b | 0000 | 2bc0 | 0000 | 0000 | e000 | 0002 | 0000 | 0944 | 0000 | 0000 | 4400 | 009c | 0000 | 2bcc | 0000 | 3885 | 8000 | 0000 |
| 1070100 | 0000 | 0000 | 0000 | 38af | 2400 | 0001 | 0000 | 2b1c | 0000 | 33ce | 8400 | 0000 | 0000 | 2bdc | 0000 | 0000 | 4400 | 023b | 0000 | 2bdc | 0000 | 0000 | 4400 | 023b |
| 1070160 | 0000 | 2be8 | 0000 | 0000 | 4400 | 023c | 0000 | 2bf8 | 0000 | 38eb | 2400 | 0001 | 0000 | 2c08 | 0000 | 0000 | 4400 | 023b | 0000 | 2c08 | 0000 | 0000 | 4400 | 023b |
| 1070240 | 0000 | 2c14 | 0000 | 0000 | 4400 | 023c | 0000 | 2c28 | 0000 | 390a | C400 | 0000 | 0000 | 2c38 | 0000 | 3915 | 0400 | 0000 | 0000 | 3180 | 0000 | 392c | 0400 | 0000 |
| 1070320 | 0000 | 31ac | 0000 | 3943 | 0400 | 0000 | 0000 | 3230 | 0000 | 3958 | 0400 | 0000 | 0000 | 2c38 | 0000 | 3969 | 0400 | 0000 | 0000 | 31d4 | 0000 | 3981 | 0800 | 0000 |
| 1070400 | 0004 | 9280 | 0000 | 3990 | 0400 | 0000 | 0000 | 3120 | 0000 | 39aa | C400 | 0000 | 0000 | 3150 | 0000 | 39c4 | 0400 | 0000 | 0000 | 30a8 | 0000 | 39db | 0400 | 0000 |
| 1070460 | 0000 | 31fc | 0000 | 39f2 | 0400 | 0000 | 0000 | 3260 | 0000 | 3a0d | 6400 | 0000 | 0000 | 2c38 | 0000 | 3a3d | 6400 | 0000 | 0000 | 2c38 | 0000 | 3a48 | 9400 | 0000 |
| 1070540 | 0000 | 2c38 | 0000 | 3a55 | 8000 | 0000 | 0000 | 0000 | 0000 | 3a7f | 8000 | 0000 | 0000 | 0000 | 0000 | 3a99 | 8000 | 0000 | 0000 | 0000 | 0000 | 3ac4 | 8000 | 0000 |
| 1070620 | 0000 | 0000 | 0000 | 3ae6 | 8000 | 0000 | 0000 | 0000 | 0000 | 3b09 | 8000 | 0000 | 0000 | 0000 | 0000 | 3b2f | 8000 | 0000 | 0000 | 0000 | 0000 | 3b51 | 8000 | 0000 |
| 1070700 | 0000 | 0000 | 0000 | 3b72 | 8000 | 0000 | 0000 | 0000 | 0000 | 3b8b | 8000 | 0000 | 0000 | 0000 | 0000 | 3ba6 | 8000 | 0000 | 0000 | 0000 | 0000 | 3bba | 8000 | 0000 |
| 1070760 | 0000 | 0000 | 0000 | 3bcc | 8000 | 0004 | ffff | fb05 | 0000 | 3bea | 8000 | 0008 | ffff | fb05 | 0000 | 3c27 | 8000 | 0001 | ffff | fb05 | 0000 | 3c44 | 8000 | 0004 |
| 1071040 | ffff | fb05 | 0000 | 3c52 | 8000 | 0004 | ffff | fb05 | 0000 | 3c63 | 8000 | 0004 | ffff | fb05 | 0000 | 3c74 | 8000 | 0004 | ffff | fb05 | 0000 | 3ceb | 8000 | 0004 |
| 1071120 | ffff | fb05 | 0000 | 3d83 | 8000 | 0004 | ffff | fb05 | 0000 | 3dc7 | 8000 | 0004 | ffff | fb05 | 0000 | 3e47 | 8000 | 0004 | ffff | fb05 | 0000 | 3ec1 | 8000 | 0004 |
| 1071200 | ffff | fb05 | 0000 | 3eef | 9000 | 003c | ffff | fb05 | 0000 | 4006 | 8000 | 003c | ffff | fb05 | 0000 | 4102 | 2000 | 0004 | 0000 | 0000 | 0000 | 4119 | 2000 | 0004 |
| 1071260 | 0000 | 0000 | 0000 | 4132 | 2000 | 0004 | 0000 | 0000 | 0000 | 414a | 2000 | 0004 | 0000 | 0000 | 0000 | 415f | 2000 | 0004 | 0000 | 0000 | 0000 | 4175 | 2000 | 0001 |
| 1071340 | 0000 | 0000 | 0000 | 418e | 8000 | 0000 | 0000 | 0000 | 0000 | 4254 | 8000 | 0000 | 0000 | 0000 | 0000 | 431a | 8000 | 0000 | 0000 | 0000 | 0000 | 43da | 8000 | 0000 |
| 1071420 | 0000 | 0000 | 0000 | 442e | 8000 | 0028 | ffff | fb05 | 0000 | 454f | 8000 | 0028 | ffff | fb05 | 0000 | 45b4 | 8000 | 0000 | 0000 | 0000 | 0000 | 467f | 8000 | 0000 |
| 1071500 | 0000 | 0000 | 0000 | 474a | 8000 | 0000 | 0000 | 0000 | 0000 | 4808 | 8000 | 0000 | 0000 | 0000 | 0000 | 48cc | 8000 | 0000 | 0000 | 0000 | 0000 | 4991 | 8000 | 0000 |
| 1071560 | 0000 | 0000 | 0000 | 49f0 | 8000 | 0048 | ffff | fb05 | 0000 | 4a6e | 8000 | 0000 | 0000 | 0000 | 0000 | 4b32 | 8000 | 0000 | 0000 | 0000 | 0000 | 4bfc | 8000 | 0000 |
| 1071640 | 0000 | 0000 | 0000 | 4cd1 | 8000 | 0000 | 0000 | 0000 | 0000 | 4d9d | 8000 | 0000 | 0000 | 0000 | 0000 | 4e3b | 8000 | 0044 | ffff | fb05 | 0000 | 4e92 | 8000 | 0000 |
| 1071720 | 0000 | 0000 | 0000 | 4f58 | 8000 | 0000 | 0000 | 0000 | 0000 | 5023 | 8000 | 0000 | 0000 | 0000 | 0000 | 50f0 | 8000 | 0000 | 0000 | 0000 | 0000 | 5132 | 2400 | 0044 |
| 1072000 | 0000 | 2c38 | 0000 | 5152 | a000 | 0044 | 0000 | 0044 | 0000 | 5162 | a000 | 0001 | 0000 | 0048 | 0000 | 516e | 8400 | 0000 | 0000 | 2c38 | 0000 | 0000 | 4400 | 01d1 |
| 1072060 | 0000 | 2c38 | 0000 | 518b | 4000 | 0044 | 0000 | 0018 | 0000 | 0000 | 4400 | 01d1 | 0000 | 2c48 | 0000 | 519b | 8000 | 0000 | 0000 | 0000 | 0000 | 51a8 | 8000 | 0000 |
| 1072140 | 0000 | 0000 | 0000 | 0000 | 4400 | 01d2 | 0000 | 2c48 | 0000 | 0000 | 4400 | 01d3 | 0000 | 2c7c | 0000 | 0000 | 4400 | 01d4 | 0000 | 2d20 | 0000 | 0000 | 4400 | 01d6 |
| 1072220 | 0000 | 2d50 | 0000 | 0000 | 4400 | 01d8 | 0000 | 2d8c | 0000 | 0000 | 4400 | 01d9 | 0000 | 2d8c | 0000 | 51b2 | 8000 | 0000 | 0000 | 0000 | 0000 | 51c7 | 8000 | 0050 |
| 1072300 | ffff | fb05 | 0000 | 5242 | 8000 | 0000 | 0000 | 0000 | 0000 | 52c9 | 2000 | 0000 | 0000 | 0000 | 0000 | 52eb | 2000 | 0000 | 0000 | 0000 | 0000 | 530e | 2000 | 0000 |
| 1072360 | 0000 | 0000 | 0000 | 531b | 2000 | 0000 | 0000 | 0000 | 0000 | 5328 | 8000 | 0001 | ffff | fb05 | 0000 | 5362 | 2000 | 0004 | 0000 | 0000 | 0000 | 5384 | 2000 | 0004 |
| 1072440 | 0000 | 0000 | 0000 | 53a6 | 8000 | 0000 | 0000 | 0000 | 0000 | 5433 | 2800 | 0001 | 0004 | 9280 | 0000 | 5449 | 8000 | 0004 | ffff | fb05 | 0000 | 5455 | 8000 | 0008 |
| 1072520 | ffff | fb05 | 0000 | 54b8 | 8000 | 0000 | 0000 | 0000 | 0000 | 5534 | 8000 | 0004 | ffff | fb05 | 0000 | 5569 | 8000 | 0000 | 0000 | 0000 | 0000 | 55bd | 8000 | 0008 |
| 1072600 | ffff | fb05 | 0000 | 5628 | 8000 | 0000 | 0000 | 0000 | 0000 | 568e | 8000 | 0004 | ffff | fb05 | 0000 | 56c3 | 8000 | 0000 | 0000 | 0000 | 0000 | 571f | 8000 | 0008 |
| 1072660 | ffff | fb05 | 0000 | 5782 | 8000 | 0000 | 0000 | 0000 | 0000 | 57e8 | 8000 | 0004 | ffff | fb05 | 0000 | 581d | 8000 | 0000 | 0000 | 0000 | 0000 | 5879 | 8000 | 0008 |
| 1072740 | ffff | fb05 | 0000 | 58e7 | 8000 | 0000 | 0000 | 0000 | 0000 | 5974 | 8000 | 0004 | ffff | fb05 | 0000 | 59ab | 8000 | 0000 | 0000 | 0000 | 0000 | 5a0d | 8000 | 0008 |
| 1073020 | ffff | fb05 | 0000 | 5a63 | 8000 | 0000 | 0000 | 0000 | 0000 | 5ae4 | 8000 | 0004 | ffff | fb05 | 0000 | 5b1b | 8000 | 0000 | 0000 | 0000 | 0000 | 5b73 | 8000 | 0008 |
| 1073100 | ffff | fb05 | 0000 | 5bc9 | 8000 | 0000 | 0000 | 0000 | 0000 | 5c33 | 8000 | 0004 | ffff | fb05 | 0000 | 5c6a | 8000 | 0000 | 0000 | 0000 | 0000 | 5cca | 8000 | 0008 |
| 1073160 | ffff | fb05 | 0000 | 5d20 | 8000 | 0000 | 0000 | 0000 | 0000 | 5d8a | 8000 | 0004 | ffff | fb05 | 0000 | 5dc1 | 8000 | 0000 | 0000 | 0000 | 0000 | 5e21 | 8000 | 0008 |
| 1073240 | ffff | fb05 | 0000 | 5e7a | 8000 | 0000 | 0000 | 0000 | 0000 | 5f0c | 8000 | 0004 | ffff | fb05 | 0000 | 5f45 | 8000 | 0000 | 0000 | 0000 | 0000 | 5fab | 2000 | 0004 |
| 1073320 | 0000 | 0000 | 0000 | 5fb8 | 2000 | 0004 | 0000 | 0000 | 0000 | 5fc8 | 8000 | 0034 | ffff | fb05 | 0000 | 60e1 | 8000 | 0034 | ffff | fb05 | 0000 | 61c3 | 8000 | 0000 |
| 1073400 | 0000 | 0000 | 0000 | 628d | 8000 | 0000 | 0000 | 0000 | 0000 | 62ba | 8000 | 0040 | ffff | fb05 | 0000 | 63d2 | 8000 | 0040 | ffff | fb05 | 0000 | 64ec | 2000 | 0004 |
| 1073460 | 0000 | 0000 | 0000 | 6506 | 8000 | 0000 | 0000 | 0000 | 0000 | 65d3 | 8000 | 0000 | 0000 | 0000 | 0000 | 667e | 8000 | 0084 | ffff | fb05 | 0000 | 6703 | 8000 | 0000 |
| 1073540 | 0000 | 0000 | 0000 | 67d8 | 8000 | 0000 | 0000 | 0000 | 0000 | 6854 | 8000 | 0004 | ffff | fb05 | 0000 | 6868 | 8000 | 0004 | ffff | fb05 | 0000 | 68a4 | 8000 | 0004 |
| 1073620 | ffff | fb05 | 0000 | 68e5 | 8000 | 0004 | ffff | fb05 | 0000 | 6923 | 8000 | 0004 | ffff | fb05 | 0000 | 695e | 8000 | 0004 | ffff | fb05 | 0000 | 699c | 8000 | 0004 |
| 1073700 | ffff | fb05 | 0000 | 69be | 8000 | 0004 | ffff | fb05 | 0000 | 69e0 | 2000 | 0001 | 0000 | 0000 | 0000 | 69ef | 8000 | 0004 | ffff | fb05 | 0000 | 6a1e | 8000 | 0000 |
| 1073760 | 0000 | 0000 | 0000 | 6aa3 | 2000 | 0008 | 0000 | 0000 | 0000 | 6ac9 | 8000 | 0008 | ffff | fb05 | 0000 | 6ad4 | 8000 | 0008 | ffff | fb05 | 0000 | 6ae0 | 8000 | 0008 |
| 1074040 | ffff | fb05 | 0000 | 6aec | 8000 | 0008 | ffff | fb05 | 0000 | 6b38 | 8000 | 0000 | 0000 | 0000 | 0000 | 6bfe | 8000 | 0000 | 0000 | 0000 | 0000 | 6c60 | 8000 | 0044 |
| 1074120 | ffff | fb05 | 0000 | 6cc2 | 8000 | 0000 | 0000 | 0000 | 0000 | 6d88 | 8000 | 0000 | 0000 | 0000 | 0000 | 6db3 | 8000 | 0008 | ffff | fb05 | 0000 | 6dbf | 8000 | 000c |

```
1074200  ffff fb05 0000 6e32 8000 0000 0000 0000 0000 6ebe 8000 0008 ffff fb05 0000 6f12 8000 0000 0000 0000 0000 6f92 8000 000c
1074260  ffff fb05 0000 7008 8000 0000 0000 0000 0000 70b3 2000 0008 0000 0000 0000 70db 8000 0004 ffff fb05 0000 7124 8000 0000
1074340  0000 0000 0000 7137 8000 0010 ffff fb05 0000 71c0 8000 0000 0000 0000 0000 7284 8000 0000 0000 0000 0000 7343 8000 0000
1074420  0000 0000 0000 735a 2000 0008 0000 0000 0000 7382 2400 0001 0000 2d9c 0000 739f a000 0010 0000 0044 0000 73b7 a000 0001
1074500  0000 0048 0000 73c4 8400 0000 0000 2d9c 0000 0000 4400 0007 0000 2d9c 0000 73d1 4000 0010 0000 0018 0000 0000 4400 0007
1074560  0000 2dac 0000 73e1 8000 0000 0000 0000 0000 73ee 8000 0000 0000 0000 0000 0000 4400 0008 0000 2dac 0000 0000 4400 0009
1074640  0000 2dac 0000 0000 4400 000a 0000 2dfc 0000 0000 4400 000b 0000 2e38 0000 0000 4400 000c 0000 2e74 0000 0000 4400 000d
1074720  0000 2ec4 0000 0000 4400 000e 0000 2eec 0000 73f8 8000 0000 0000 0000 0000 7413 2400 0001 0000 2efc 0000 743b a000 0010
1075000  0000 0044 0000 744b a000 0001 0000 0048 0000 7458 a000 0004 0000 004c 0000 0000 4400 0012 0000 2efc 0000 7468 4000 0010
1075060  0000 0018 0000 0000 4400 0012 0000 2f10 0000 7478 8000 0000 0000 0000 0000 7485 8000 0000 0000 0000 0000 0000 4400 0013
1075140  0000 2f10 0000 748f 8000 0000 0000 0000 0000 0000 4400 0014 0000 2f10 0000 0000 4400 0013 0000 2f10 0000 0000 4400 0014
1075220  0000 2f40 0000 0000 4400 0015 0000 2f70 0000 0000 4400 0016 0000 2fa0 0000 0000 4400 0017 0000 2fa4 0000 0000 4400 0018
1075300  0000 2fb4 0000 0000 4400 001a 0000 2fd0 0000 749d 8000 0000 0000 0000 0000 74c3 2400 0004 0000 2fe0 0000 74dd a000 0010
1075360  0000 0044 0000 74ed a000 0004 0000 0048 0000 0000 4400 001d 0000 2fe0 0000 0000 4400 001d 0000 2ff4 0000 74f9 8000 0000
1075440  0000 0000 0000 7506 8000 0000 0000 0000 0000 0000 4400 001e 0000 2ff4 0000 0000 4400 001f 0000 300c 0000 0000 4400 0020
1075520  0000 3024 0000 0000 4400 0023 0000 3030 0000 0000 4400 0024 0000 303c 0000 7510 8000 0000 0000 0000 0000 7528 2400 0001
1075600  0000 304c 0000 754c 8400 0000 0000 304c 0000 0000 4400 023b 0000 304c 0000 0000 4400 023b 0000 3058 0000 0000 4400 023c
1075660  0000 3068 0000 7569 2400 0001 0000 3078 0000 0000 4400 023b 0000 3078 0000 0000 4400 023b 0000 3084 0000 0000 4400 023c
1075740  0000 3098 0000 758d 2000 0008 0000 0000 0000 75bb 2000 0008 0000 0000 0000 75f6 2400 0001 0000 30a8 0000 7613 a000 000c
1076020  0000 0044 0000 762b a000 0001 0000 0048 0000 7638 8400 0000 0000 30a8 0000 0000 4400 0012 0000 30a8 0000 766c 4000 000c
1076100  0000 0018 0000 0000 4400 0012 0000 30b8 0000 767c 8000 0000 0000 0000 0000 7689 8000 0000 0000 0000 0000 0000 4400 0013
1076160  0000 30b8 0000 0000 4400 0011 0000 30b8 0000 0000 4400 0012 0000 30dc 0000 0000 4400 0013 0000 3110 0000 7693 8000 0000
1076240  0000 0000 0000 76ae 2400 0004 0000 3120 0000 76ce a000 0008 0000 0044 0000 76de a000 0004 0000 0048 0000 76f7 8400 0000
1076320  0000 3120 0000 0000 4400 001b 0000 3120 0000 0000 4400 001b 0000 3134 0000 772a 8000 0000 0000 0000 0000 7737 8000 0000
1076400  0000 0000 0000 0000 4400 001c 0000 3134 0000 0000 4400 001a 0000 3134 0000 7745 8000 0000 0000 0000 0000 7763 2400 0004
1076460  0000 3150 0000 7783 a000 0008 0000 0044 0000 7793 a000 0004 0000 0048 0000 0000 4400 001a 0000 3164 0000 77a4 8000 0000
1076540  0000 0000 0000 77b1 8000 0000 0000 0000 0000 0000 4400 001b 0000 3164 0000 0000 4400 0019 0000 3164 0000 77bf 8000 0000
1076620  0000 0000 0000 77dd 2400 0001 0000 3180 0000 77fa a000 0008 0000 0044 0000 780a a000 0001 0000 0048 0000 781b a000 0008
1076700  0000 004c 0000 0000 4400 0019 0000 319c 0000 782c 8000 0000 0000 0000 0000 7839 8000 0000 0000 0000 0000 0000 4400 001a
1076760  0000 319c 0000 7847 8000 0000 0000 0000 0000 0000 4400 001b 0000 319c 0000 0000 4400 0018 0000 319c 0000 7855 8000 0000
1077040  0000 0000 0000 7870 2400 0001 0000 31ac 0000 788d a000 0008 0000 0044 0000 789d a000 0001 0000 0048 0000 78ae a000 0004
1077120  0000 004c 0000 0000 4400 0018 0000 31c4 0000 78be 8000 0000 0000 0000 0000 78cb 8000 0000 0000 0000 0000 0000 4400 0019
1077200  0000 31c4 0000 78d9 8000 0000 0000 0000 0000 0000 4400 001a 0000 31c4 0000 0000 4400 0017 0000 31c4 0000 78e7 8000 0000
1077260  0000 0000 0000 7902 2400 0001 0000 31d4 0000 7920 a000 0008 0000 0044 0000 7930 a000 0001 0000 0048 0000 7941 a000 0001
1077340  0000 004c 0000 0000 4400 0017 0000 31ec 0000 7952 8000 0000 0000 0000 0000 795f 8000 0000 0000 0000 0000 0000 4400 0018
1077420  0000 31ec 0000 796d 8000 0000 0000 0000 0000 0000 4400 0019 0000 31ec 0000 0000 4400 0016 0000 31ec 0000 797b 8000 0000
1077500  0000 0000 0000 7997 2400 0001 0000 31fc 0000 79b5 a000 0008 0000 0044 0000 79c5 a000 0001 0000 0048 0000 79d6 a000 0004
1077560  0000 004c 0000 0000 4400 0016 0000 3214 0000 79e6 8000 0000 0000 0000 0000 79f3 8000 0000 0000 0000 0000 0000 4400 0017
1077640  0000 3214 0000 7a01 8000 0000 0000 0000 0000 0000 4400 0018 0000 3214 0000 0000 4400 0015 0000 3214 0000 7a0f 8000 0000
1077720  0000 0000 0000 7a2a 2400 0001 0000 3230 0000 7a46 a000 0008 0000 0044 0000 7a56 a000 0004 0000 0048 0000 0000 4400 0015
1100000  0000 3244 0000 7a66 8000 0000 0000 0000 0000 7a73 8000 0000 0000 0000 0000 0000 4400 0016 0000 3244 0000 0000 4400 0014
1100060  0000 3244 0000 7a81 8000 0000 0000 0000 0000 7a9a 2400 0004 0000 3260 0000 7abb a000 0004 0000 0044 0000 7acb a000 0004
1100140  0000 0048 0000 7adc 8400 0000 0000 3260 0000 0000 4400 0015 0000 3260 0000 0000 4400 0015 0000 3274 0000 7b0e 8000 0000
1100220  0000 0000 0000 7b1b 8000 0000 0000 0000 0000 0000 4400 0016 0000 3274 0000 0000 4400 0014 0000 3274 0000 7b29 8000 0000
1100300  0000 0000 0000 7b48 0400 0000 0000 3290 0000 7b54 0400 0000 0000 44f0 0000 7b7d 0400 0000 0000 45fc 0000 7b94 0400 0000
1100360  0000 4628 0000 7bab 0400 0000 0000 46ac 0000 7bc0 0400 0000 0000 3290 0000 7bd1 0400 0000 0000 4650 0000 7be9 0800 0000
1100440  0004 9288 0000 7bf8 0400 0000 0000 459c 0000 7c12 0400 0000 0000 45cc 0000 7c2c 0400 0000 0000 4524 0000 7c43 0400 0000
1100520  0000 4678 0000 7c5a 0400 0000 0000 33f4 0000 7c6b 0400 0000 0000 46dc 0000 7c86 6400 0000 0000 3290 0000 7cb6 6400 0000
1100600  0000 3290 0000 7cc2 8400 0000 0000 3290 0000 7cd0 8000 0000 0000 0000 0000 7cfa 8000 0000 0000 0000 0000 7d14 8000 0000
1100660  0000 0000 0000 7d3f 8000 0000 0000 0000 0000 7d61 8000 0000 0000 0000 0000 7d84 8000 0000 0000 0000 0000 7daa 8000 0000
1100740  0000 0000 0000 7dcc 8000 0000 0000 0000 0000 7ded 8000 0000 0000 0000 0000 7e06 8000 0000 0000 0000 0000 7e21 8000 0000
1101020  0000 0000 0000 7e35 8000 0000 0000 0000 0000 7e47 8000 0004 ffff fb05 0000 7e65 8000 0008 ffff fb05 0000 7ea2 8000 0001
1101100  ffff fb05 0000 7ebf 8000 0004 ffff fb05 0000 7ecd 2000 0004 0000 0000 0000 7eda 2000 0004 0000 0000 0000 7eea 2000 0001
1101160  0000 0000 0000 7f09 2000 0004 0000 0000 0000 7f14 2000 0004 0000 0000 0000 7f21 2000 0004 0000 0000 0000 7f2e 2000 0001
1101240  0000 0000 0000 7f3d 2000 0004 0000 0000 0000 7f4b 2000 0004 0000 0000 0000 7f59 8000 0004 ffff fb05 0000 7f6a 8000 0004
```

```
1101320  ffff fb05 0000 7f78 8000 0004 ffff fb05 0000 7f89 8000 0004 ffff fb05 0000 7f9a 8000 0004 ffff fb05 0000 8011 8000 0004
1101400  ffff fb05 0000 80a9 8000 0004 ffff fb05 0000 80ed 8000 0004 ffff fb05 0000 816d 8000 0004 ffff fb05 0000 81e7 8000 0004
1101460  ffff fb05 0000 8215 8000 003c ffff fb05 0000 832c 8000 003c ffff fb05 0000 8428 2000 0004 0000 0000 0000 843f 2000 0004
1101540  0000 0000 0000 8458 2000 0004 0000 0000 0000 8470 2000 0004 0000 0000 0000 8485 2000 0004 0000 0000 0000 849b 2000 0001
1101620  0000 0000 0000 84b4 8000 0000 0000 0000 0000 857a 8000 0000 0000 0000 0000 8640 8000 0000 0000 0000 0000 8700 8000 0000
1101700  0000 0000 0000 8754 8000 0028 ffff fb05 0000 886e 8000 0028 ffff fb05 0000 88d3 8000 0000 0000 0000 0000 899e 8000 0000
1101760  0000 0000 0000 8a69 8000 0000 0000 0000 0000 8b27 8000 0000 0000 0000 0000 8beb 8000 0000 0000 0000 0000 8cb0 8000 0000
1102040  0000 0000 0000 8d0f 8000 0048 ffff fb05 0000 8d8d 8000 0000 0000 0000 0000 8e51 8000 0000 0000 0000 0000 8f1b 8000 0000
1102120  0000 0000 0000 8ff0 8000 0000 0000 0000 0000 90bc 8000 0000 0000 0000 0000 915a 8000 0044 ffff fb05 0000 91b1 8000 0000
1102200  0000 0000 0000 9277 8000 0000 0000 0000 0000 9342 8000 0000 0000 0000 0000 940f 8000 0000 0000 0000 0000 9451 2400 0044
1102260  0000 3290 0000 9471 a000 0044 0000 0044 0000 9481 a000 0001 0000 0048 0000 948d 8400 0000 0000 3290 0000 0000 4400 01d1
1102340  0000 3290 0000 94a3 4000 0044 0000 0018 0000 0000 4400 01d1 0000 32a0 0000 94ba 8000 0000 0000 0000 0000 94c7 8000 0000
1102420  0000 0000 0000 0000 4400 01d2 0000 32a0 0000 0000 4400 01d3 0000 32d4 0000 0000 4400 01d4 0000 3378 0000 0000 4400 01d6
1102500  0000 33a8 0000 0000 4400 01d9 0000 33d8 0000 0000 4400 01d9 0000 33e4 0000 94d1 8000 0000 0000 0000 0000 94e6 8000 0050
1102560  ffff fb05 0000 9561 8000 0000 0000 0000 0000 95e8 2000 0000 0000 0000 0000 960a 2000 0000 0000 0000 0000 962d 2000 0000
1102640  0000 0000 0000 963a 2000 0000 0000 0000 0000 9647 0000 0001 ffff fb05 0000 9681 2000 0004 0000 0000 0000 96a3 2000 0004
1102720  0000 0000 0000 96c5 8000 0000 0000 0000 0000 9752 2800 0001 0004 9288 0000 9768 8000 0004 ffff fb05 0000 9774 8000 0008
1103000  ffff fb05 0000 97d7 8000 0000 0000 0000 0000 9853 8000 0004 ffff fb05 0000 9888 8000 0000 0000 0000 0000 98dc 8000 0008
1103060  ffff fb05 0000 9947 8000 0000 0000 0000 0000 99ad 8000 0004 ffff fb05 0000 99e2 8000 0000 0000 0000 0000 9a3e 8000 0008
1103140  ffff fb05 0000 9aa1 8000 0000 0000 0000 0000 9b07 8000 0004 ffff fb05 0000 9b3c 8000 0000 0000 0000 0000 9b98 8000 0008
1103220  ffff fb05 0000 9c06 8000 0000 0000 0000 0000 9c93 8000 0004 ffff fb05 0000 9cca 8000 0000 0000 0000 0000 9d2c 8000 0008
1103300  ffff fb05 0000 9d82 8000 0000 0000 0000 0000 9e03 8000 0004 ffff fb05 0000 9e3a 8000 0000 0000 0000 0000 9e92 8000 0008
1103360  ffff fb05 0000 9ee8 8000 0000 0000 0000 0000 9f52 8000 0004 ffff fb05 0000 9f89 8000 0000 0000 0000 0000 9fe9 8000 0008
1103440  ffff fb05 0000 a03f 8000 0000 0000 0000 0000 a0a9 8000 0004 ffff fb05 0000 a0e0 8000 0000 0000 0000 0000 a140 8000 0008
1103520  ffff fb05 0000 a199 8000 0000 0000 0000 0000 a22b 8000 0004 ffff fb05 0000 a264 8000 0000 0000 0000 0000 a2ca 8000 0034
1103600  ffff fb05 0000 a3e3 8000 0034 ffff fb05 0000 a4c5 8000 0000 0000 0000 0000 a58f 8000 0000 0000 0000 0000 a5bc 8000 0040
1103660  ffff fb05 0000 a6d4 8000 0040 ffff fb05 0000 a7ee 2000 0004 0000 0000 0000 a808 8000 0000 0000 0000 0000 a8d5 8000 0000
1103740  0000 0000 0000 a980 8000 0084 ffff fb05 0000 aa05 8000 0000 0000 0000 0000 aada 8000 0000 0000 0000 0000 ab56 8000 0004
1104020  ffff fb05 0000 ab6a 8000 0004 ffff fb05 0000 aba6 8000 0004 ffff fb05 0000 abe7 8000 0004 ffff fb05 0000 ac25 8000 0004
1104100  ffff fb05 0000 ac60 8000 0004 ffff fb05 0000 ac9e 8000 0004 ffff fb05 0000 acc0 8000 0004 ffff fb05 0000 ace2 2000 0001
1104160  0000 0000 0000 acf1 8000 0004 ffff fb05 0000 ad20 8000 0000 0000 0000 0000 ada5 2000 0008 0000 0000 0000 adcc 8000 0008
1104240  ffff fb05 0000 add7 8000 0008 ffff fb05 0000 ade3 8000 0008 ffff fb05 0000 adef 8000 0008 ffff fb05 0000 ae3b 8000 0000
1104320  0000 0000 0000 af01 8000 0000 0000 0000 0000 af63 8000 0044 ffff fb05 0000 afc5 8000 0000 0000 0000 0000 b08b 8000 0000
1104400  0000 0000 0000 b0b6 8000 0008 ffff fb05 0000 b0c2 8000 000c ffff fb05 0000 b135 8000 0000 0000 0000 0000 b1c1 8000 0008
1104460  ffff fb05 0000 b215 8000 0000 0000 0000 0000 b295 8000 000c ffff fb05 0000 b30b 8000 0000 0000 0000 0000 b3b6 2000 0008
1104540  0000 0000 0000 b3df 8000 000c ffff fb05 0000 b443 8000 0000 0000 0000 0000 b504 8000 0000 0000 0000 0000 b574 2000 0008
1104620  0000 0000 0000 b599 8000 000c ffff fb05 0000 b5fe 8000 0000 0000 0000 0000 b6cc 8000 0000 0000 0000 0000 b73a 2000 0008
1104700  0000 0000 0000 b760 8000 0008 ffff fb05 0000 b7c1 8000 0000 0000 0000 0000 b868 8000 0010 ffff fb05 0000 b8f8 8000 0000
1104760  0000 0000 0000 b939 8000 0018 ffff fb05 0000 ba39 8000 0000 0000 0000 0000 bb09 8000 0000 0000 0000 0000 bb91 2000 0008
1105040  0000 0000 0000 bbb8 8000 0004 ffff fb05 0000 bc01 8000 0000 0000 0000 0000 bc14 8000 0010 ffff fb05 0000 bc9d 8000 0000
1105120  0000 0000 0000 bd61 8000 0000 0000 0000 0000 be20 8000 0000 0000 0000 0000 be37 2000 0008 0000 0000 0000 be60 8000 003c
1105200  ffff fb05 0000 bf61 8000 003c ffff fb05 0000 bfc6 8000 0000 0000 0000 0000 c08c 8000 0000 0000 0000 0000 c149 8000 0000
1105260  0000 0000 0000 c1dc 2000 0008 0000 0000 0000 c203 8000 008c ffff fb05 0000 c2fd 8000 008c ffff fb05 0000 c3a2 8000 0000
1105340  0000 0000 0000 c46f 8000 0000 0000 0000 0000 c52c 8000 0000 0000 0000 0000 c5fb 8000 0000 0000 0000 0000 c681 2000 0008
1105420  0000 0000 0000 c6a7 2400 003c 0000 33f4 0000 c6c7 a000 003c 0000 0044 0000 c6d7 8400 0000 0000 33f4 0000 0000 4400 0010
1105500  0000 33f4 0000 c6e8 4000 003c 0000 0018 0000 0000 4400 0010 0000 3400 0000 c6f8 8000 0000 0000 0000 0000 0000 4400 000f
1105560  0000 3400 0000 0000 4400 0010 0000 3508 0000 0000 4400 0011 0000 350c 0000 0000 4400 0012 0000 3510 0000 0000 4400 0010
1105640  0000 3514 0000 0000 4400 0028 0000 3528 0000 0000 4400 0029 0000 3534 0000 c705 8000 0000 0000 0000 0000 c71a 8000 003c
1105720  ffff fb05 0000 c822 8000 003c ffff fb05 0000 c8ae 8000 0000 0000 0000 0000 c971 8000 0000 0000 0000 0000 ca43 8000 0000
1106000  0000 0000 0000 cb0e 8000 0000 0000 0000 0000 cbea 8000 0000 0000 0000 0000 ccc4 8000 0000 0000 0000 0000 cd8b 8000 0000
1106060  0000 0000 0000 cdd9 2000 0008 0000 0000 0000 ce03 2000 0001 0000 0000 0000 ce24 2000 0001 0000 0000 0000 ce46 2000 0001
1106140  0000 0000 0000 ce52 8400 0000 0000 3544 0000 ce60 2000 0001 0000 0000 0000 ce6c 2000 0001 0000 0000 0000 ce93 2000 0001
1106220  0000 0000 0000 cea1 2400 0001 0000 3544 0000 cebf a000 003c 0000 0044 0000 ced0 a000 0001 0000 0048 0000 0000 4400 0019
1106300  0000 3544 0000 cedd 4000 003c 0000 0018 0000 0000 4400 0019 0000 3554 0000 ceee 8000 0000 0000 0000 0000 cefb 8000 0000
1106360  0000 0000 0000 0000 4400 001a 0000 3554 0000 0000 4400 001b 0000 35bc 0000 0000 4400 001c 0000 360c 0000 0000 4400 001d
```

```
1106440  0000 361c 0000 0000 4400 001e 0000 3654 0000 0000 4400 001f 0000 3668 0000 cf05 8000 0000 0000 0000 0000 cf21 2400 0001
1106520  0000 3678 0000 cf4a a000 003c 0000 0044 0000 cf5b a000 0001 0000 0048 0000 0000 4400 0023 0000 3678 0000 cf68 4000 003c
1106600  0000 0018 0000 0000 4400 0023 0000 3688 0000 cf79 8000 0000 0000 0000 0000 cf86 8000 0000 0000 0000 0000 0000 4400 0024
1106660  0000 3688 0000 0000 4400 0025 0000 36a8 0000 0000 4400 0026 0000 36b8 0000 0000 4400 0027 0000 36d8 0000 0000 4400 0028
1106740  0000 36e8 0000 0000 4400 0029 0000 3708 0000 0000 4400 002b 0000 3718 0000 0000 4400 002c 0000 3734 0000 0000 4400 002e
1107020  0000 3738 0000 cf90 8000 0000 0000 0000 0000 cfb7 2400 0001 0000 3748 0000 cfe8 a000 003c 0000 0044 0000 cff9 a000 0001
1107100  0000 0048 0000 d006 a000 008c 0000 004c 0000 0000 4400 0031 0000 3748 0000 d01c 4000 003c 0000 0018 0000 0000 4400 0031
1107160  0000 375c 0000 d02d 8000 0008 ffff fff8 0000 d03a 8000 0008 ffff fff4 0000 d046 8000 003c ffff fff0 0000 d053 8000 000c
1107240  ffff ffec 0000 0000 c000 0002 0000 04cc 0000 d06a 8000 0000 0000 0000 0000 0000 4400 0036 0000 375c 0000 d077 8000 0000
1107320  0000 0000 0000 0000 4400 0037 0000 375c 0000 d081 8000 0000 0000 0000 0000 0000 4400 0038 0000 375c 0000 d08b 8000 0000
1107400  0000 0000 0000 0000 4400 0039 0000 375c 0000 d096 8000 0000 0000 0000 0000 0000 4400 003a 0000 375c 0000 d0a0 8000 0000
1107460  0000 0000 0000 0000 4400 003b 0000 375c 0000 d0aa 8000 0000 0000 0000 0000 0000 4400 003c 0000 375c 0000 d0bf 8000 0000
1107540  0000 0000 0000 0000 4400 003d 0000 375c 0000 0000 4400 0032 0000 375c 0000 0000 4400 0037 0000 3780 0000 0000 4400 0038
1107620  0000 3794 0000 0000 4400 0039 0000 37a0 0000 0000 4400 003a 0000 37c0 0000 0000 4400 003b 0000 37d0 0000 0000 4400 003c
1107700  0000 37e0 0000 0000 4400 003d 0000 37f0 0000 0000 4400 003e 0000 37fc 0000 0000 4400 0041 0000 380c 0000 0000 4400 0042
1107760  0000 3824 0000 0000 4400 0044 0000 382c 0000 0000 4400 0047 0000 388c 0000 0000 4400 0049 0000 38a4 0000 0000 e000 0002
1110040  0000 063c 0000 0000 4400 0049 0000 38cc 0000 d0d3 8000 0000 0000 0000 0000 d102 2400 0001 0000 38dc 0000 d130 a000 003c
1110120  0000 0044 0000 d141 a000 0001 0000 0048 0000 d151 a000 0004 0000 004c 0000 0000 4400 004d 0000 38dc 0000 d160 4000 003c
1110200  0000 0018 0000 0000 4400 004d 0000 38f0 0000 d171 8000 0004 ffff fffc 0000 d182 8000 0004 ffff fff8 0000 d18f 8000 0004
1110260  ffff fff4 0000 d19d 8000 0001 ffff fff0 0000 0000 c000 0002 0000 0660 0000 d1ab 8000 0000 0000 0000 0000 0000 4400 0052
1110340  0000 38f0 0000 d1b8 8000 0000 0000 0000 0000 0000 4400 0053 0000 38f0 0000 d1c5 8000 0000 0000 0000 0000 0000 4400 0054
1110420  0000 38f0 0000 d1d2 8000 0000 0000 0000 0000 0000 4400 0055 0000 38f0 0000 d1e2 8000 0000 0000 0000 0000 0000 4400 0056
1110500  0000 38f0 0000 d1ee 8000 0000 0000 0000 0000 0000 4400 0057 0000 38f0 0000 d1fb 8000 0000 0000 0000 0000 0000 4400 0058
1110560  0000 38f0 0000 0000 4400 004e 0000 38f0 0000 0000 4400 0051 0000 38f4 0000 0000 4400 0053 0000 390c 0000 0000 4400 0055
1110640  0000 3928 0000 0000 4400 0056 0000 3940 0000 0000 4400 0057 0000 3960 0000 0000 4400 0058 0000 3984 0000 0000 4400 0059
1110720  0000 39b8 0000 0000 4400 005a 0000 39c4 0000 0000 4400 005b 0000 39d0 0000 0000 4400 005c 0000 39e4 0000 0000 4400 005e
1111000  0000 3a1c 0000 0000 4400 0060 0000 3a2c 0000 0000 4400 0061 0000 3a60 0000 0000 4400 0064 0000 3a80 0000 0000 4400 0066
1111060  0000 3ae0 0000 0000 e000 0002 0000 085c 0000 0000 4400 0067 0000 3aec 0000 d207 8000 0000 0000 0000 0000 d232 2400 0001
1111140  0000 3afc 0000 d259 a000 003c 0000 0044 0000 d26a a000 0001 0000 0048 0000 d27a a000 0004 0000 004c 0000 0000 4400 006c
1111220  0000 3afc 0000 d289 4000 003c 0000 0018 0000 0000 4400 006c 0000 3b10 0000 d29a 8000 0001 ffff fffc 0000 0000 c000 0002
1111300  0000 0880 0000 d2a8 8000 0000 0000 0000 0000 0000 4400 006e 0000 3b10 0000 d2b5 8000 0000 0000 0000 0000 0000 4400 006f
1111360  0000 3b10 0000 d2c2 8000 0000 0000 0000 0000 0000 4400 0070 0000 3b10 0000 d2cf 8000 0000 0000 0000 0000 0000 4400 0071
1111440  0000 3b10 0000 0000 4400 006d 0000 3b10 0000 0000 4400 006e 0000 3b28 0000 0000 4400 0070 0000 3b30 0000 0000 4400 0071
1111520  0000 3b60 0000 0000 4400 0072 0000 3b94 0000 0000 4400 0073 0000 3ba4 0000 0000 4400 0075 0000 3bc0 0000 0000 4400 0076
1111600  0000 3c10 0000 0000 e000 0002 0000 098c 0000 0000 4400 0077 0000 3c1c 0000 d2db 8000 0000 0000 0000 0000 d2ff 2400 0001
1111660  0000 3c2c 0000 d32a a000 003c 0000 0044 0000 d33b a000 0001 0000 0048 0000 0000 4400 007b 0000 3c2c 0000 d348 4000 003c
1111740  0000 0018 0000 0000 4400 007b 0000 3c3c 0000 d359 8000 0000 0000 0000 0000 d366 8000 0000 0000 0000 0000 0000 4400 007c
1112020  0000 3c3c 0000 0000 4400 007d 0000 3c3c 0000 0000 4400 007e 0000 3c44 0000 0000 4400 007f 0000 3c64 0000 0000 4400 0080
1112100  0000 3c94 0000 0000 4400 0081 0000 3ca6 0000 0000 4400 0083 0000 3cc4 0000 0000 4400 0084 0000 3cf4 0000 0000 4400 0085
1112160  0000 3d08 0000 0000 4400 0088 0000 3d24 0000 0000 4400 0089 0000 3d34 0000 0000 4400 008c 0000 333c 0000 d370 8000 0000
1112240  0000 0000 0000 d399 2400 0004 0000 3d4c 0000 d3be a000 003c 0000 0044 0000 0000 4400 0090 0000 3d4c 0000 d3cf 4000 003c
1112320  0000 0018 0000 0000 4400 0090 0000 3d56 0000 d3e0 8000 003c ffff fffc 0000 0000 c000 0002 0000 0ac8 0000 d3ed 8000 0000
1112400  0000 0000 0000 0000 4400 0092 0000 3d58 0000 d3fa 8000 0000 0000 0000 0000 0000 4400 0093 0000 3d58 0000 0000 4400 0091
1112460  0000 3d58 0000 0000 4400 0092 0000 336c 0000 0000 4400 0093 0000 3d90 0000 0000 4400 0095 0000 3d9c 0000 0000 e000 0002
1112540  0000 Cb18 0000 0000 4400 0096 0000 3da6 0000 d4c4 8000 0000 0000 0000 0000 d427 2400 003c 0000 3db8 0000 d45d a000 003c
1112620  0000 0044 0000 d46e a000 0004 0000 0048 0000 0000 4400 009a 0000 3db8 0000 d47c 4000 003c 0000 0018 0000 0000 4400 009a
1112700  0000 3dc8 0000 d48d 8000 0000 0000 0000 0000 d49a 8000 0000 0000 0000 0000 0000 4400 009b 0000 34c8 0000 0000 4400 009d
1112760  0000 3dd0 0000 0000 4400 009f 0000 3dd8 0000 0000 4400 00a1 0000 3de4 0000 0000 4400 00a3 0000 3df4 0000 0000 4400 00a5
1113040  0000 3e00 0000 0000 4400 009d 0000 3e0c 0000 0000 4400 00a9 0000 3e40 0000 0000 4400 00ab 0000 3e48 0000 0000 4400 00ad
1113120  0000 3e54 0000 0000 4400 00af 0000 3e60 0000 0000 4400 00b1 0000 3e70 0000 0000 4400 00a9 0000 3e7c 0000 0000 4400 00b5
1113200  0000 3eb0 0000 0000 4400 00b7 0000 3eb8 0000 0000 4400 00b9 0000 3ec8 0000 0000 4400 00bb 0000 3ed4 0000 0000 4400 00bd
1113260  0000 3ee0 0000 0000 4400 00b5 0000 3eec 0000 0000 4400 00c3 0000 3f20 0000 0000 4400 00c4 0000 3f38 0000 0000 4400 009b
1113340  0000 3f44 0000 0000 4400 00c6 0000 3f78 0000 d4a5 8000 0000 0000 0000 0000 d4d7 2400 0004 0000 3f88 0000 d4ff a000 003c
1113420  0000 0044 0000 0000 4400 00cb 0000 3f88 0000 d510 4000 003c 0000 0018 0000 0000 4400 00cb 0000 3f94 0000 d521 8000 003c
1113500  ffff fffc 0000 0000 c000 0002 0000 0d04 0000 d52e 8000 0000 0000 0000 0000 0000 4400 00cd 0000 3f94 0000 d53b 8000 0000
```

```
1113560 0000 0000 0000 0000 4400 00ce 0000 3f94 0000 0000 4400 00cf 0000 3fa4 0000 0000 4400 00d1 0000 3fc0 0000 0000 4400 00d3
1113640 0000 3fc4 0000 0000 e000 0002 0000 0d48 0000 0000 4400 00d4 0000 3fd8 0000 d545 8000 0000 0000 0000 0000 d56b 2400 0004
1113720 0000 3fe8 0000 d590 a000 003c 0000 0044 0000 0000 4400 00da 0000 3fe8 0000 d5a1 4000 003c 0000 0018 0000 0000 4400 00da
1114000 0000 3ff4 0000 d5b2 8000 0000 0000 0000 0000 0000 4400 00db 0000 3ff4 0000 0000 4400 00dc 0000 4004 0000 0000 4400 00de
1114060 0000 4018 0000 0000 4400 00df 0000 403c 0000 0000 4400 00e1 0000 403c 0000 0000 4400 00e2 0000 405c 0000 0000 4400 00e4
1114140 0000 407c 0000 0000 4400 00e5 0000 409c 0000 0000 4400 00e7 0000 40bc 0000 0000 4400 00e8 0000 40c8 0000 d5bf 8000 0000
1114220 0000 0000 0000 d5e2 2400 0001 0000 40d8 0000 d620 a000 003c 0000 0044 0000 d631 a000 008c 0000 0048 0000 d63f a000 0001
1114300 0000 004c 0000 d54f a000 0004 0000 0050 0000 0000 4400 00ee 0000 40d8 0000 d65e 4000 003c 0000 0018 0000 0000 4400 00ee
1114360 0000 40f0 0000 d66f 8000 0004 ffff fffc 0000 d57d 8000 0004 ffff fff8 0000 d688 8000 0001 ffff fff4 0000 0000 c000 0002
1114440 0000 0e60 0000 d696 8000 0000 0000 0000 0000 0000 4400 00f2 0000 40f0 0000 d6a3 8000 0000 0000 0000 0000 0000 4400 00f3
1114520 0000 40f0 0000 d6ad 8000 0000 0000 0000 0000 0000 4400 00f4 0000 40f0 0000 d6ba 8000 0000 0000 0000 0000 0000 4400 00f5
1114600 0000 40f0 0000 d6c7 8000 0000 0000 0000 0000 0000 4400 00f6 0000 40f0 0000 d6d4 8000 0000 0000 0000 0000 0000 4400 00f7
1114660 0000 40f0 0000 d6de 8000 0000 0000 0000 0000 0000 4400 00f8 0000 40f0 0000 0000 4400 00f1 0000 40f0 0000 0000 4400 00f3
1114740 0000 4108 0000 0000 4400 00f4 0000 4118 0000 0000 4400 00f7 0000 4144 0000 0000 4400 00f8 0000 414c 0000 0000 4400 00fb
1115020 0000 4154 0000 0000 4400 00fd 0000 4164 0000 0000 4400 00fe 0000 4174 0000 0000 4400 0100 0000 418c 0000 0000 4400 0101
1115100 0000 419c 0000 0000 4400 0103 0000 41b8 0000 0000 4400 0105 0000 41c8 0000 0000 4400 0108 0000 4204 0000 0000 4400 0109
1115160 0000 421c 0000 0000 4400 010a 0000 425c 0000 0000 4400 010b 0000 4270 0000 0000 4400 010c 0000 427c 0000 0000 4400 010d
1115240 0000 4290 0000 0000 4400 0108 0000 42a4 0000 0000 4400 0110 0000 42ac 0000 0000 e000 0002 0000 1028 0000 0000 4400 0111
1115320 0000 42b8 0000 d6ea 8000 0000 0000 0000 0000 d725 2400 0001 0000 42c8 0000 d760 a000 003c 0000 0044 0000 d771 a000 008c
1115400 0000 0048 0000 d77f a000 0001 0000 004c 0000 d79f a000 0004 0000 0050 0000 0000 4400 0118 0000 42c8 0000 d79e 4000 003c
1115460 0000 0018 0000 0000 4400 0118 0000 42e0 0000 d7af 8000 0004 ffff fffc 0000 d7ba 8000 0004 ffff fff8 0000 d7c8 8000 0001
1115540 ffff fff4 0000 0000 c000 0002 0000 1050 0000 d7d6 8000 0000 0000 0000 0000 0000 4400 011c 0000 42e0 0000 d7e3 8000 0000
1115620 0000 0000 0000 0000 4400 011d 0000 42e0 0000 d7ed 8000 0000 0000 0000 0000 0000 4400 011e 0000 42e0 0000 d7fa 8000 0000
1115700 0000 0000 0000 0000 4400 011f 0000 42e0 0000 d807 8000 0000 0000 0000 0000 0000 4400 0120 0000 42e0 0000 d811 8000 0000
1115760 0000 0000 0000 0000 4400 0121 0000 42e0 0000 d81e 8000 0000 0000 0000 0000 0000 4400 0122 0000 42e0 0000 0000 4400 011d
1116040 0000 42e0 0000 0000 4400 011e 0000 42f0 0000 0000 4400 0122 0000 431c 0000 0000 4400 0123 0000 4324 0000 0000 4400 0124
1116120 0000 432c 0000 0000 4400 0125 0000 4344 0000 0000 4400 0127 0000 4354 0000 0000 4400 0128 0000 4364 0000 0000 4400 012a
1116200 0000 437c 0000 0000 4400 012b 0000 438c 0000 0000 4400 012d 0000 43a8 0000 0000 4400 012e 0000 43b8 0000 0000 4400 0131
1116260 0000 43e0 0000 0000 4400 0132 0000 43f8 0000 0000 4400 0133 0000 4428 0000 0000 4400 0134 0000 443c 0000 0000 4400 0135
1116340 0000 4448 0000 0000 4400 0136 0000 445c 0000 0000 4400 0131 0000 4470 0000 0000 4400 013a 0000 4478 0000 0000 e000 0002
1116420 0000 11f4 0000 0000 4400 013b 0000 4484 0000 d82a 8000 0000 0000 0000 0000 d862 2400 0001 0000 4494 0000 d883 8400 0000
1116500 0000 4494 0000 0000 4400 023b 0000 4494 0000 0000 4400 023b 0000 44a0 0000 0000 4400 023c 0000 44b0 0000 d8a0 2400 0001
1116560 0000 44c0 0000 0000 4400 023b 0000 44c0 0000 0000 4400 023b 0000 44cc 0000 0000 4400 023c 0000 44e0 0000 d8c1 2000 0008
1116640 0000 0000 0000 d9f1 2000 0008 0000 0000 0000 d92e 2400 0001 0000 44f0 0000 d95d a000 003c 0000 0044 0000 d96e a000 0001
1116720 0000 0048 0000 d97b 8400 0000 0000 44f0 0000 0000 4400 002e 0000 44f0 0000 d98f 4000 003c 0000 0018 0000 0000 4400 002e
1117000 0000 4500 0000 d9a0 8000 0000 0000 0000 0000 d9ad 8000 0000 0000 0000 0000 0000 4400 002f 0000 4500 0000 0000 4400 002d
1117060 0000 4500 0000 d9b7 8000 0000 0000 0000 0000 d9e4 2400 0001 0000 4524 0000 da01 a000 000c 0000 0044 0000 da1a a000 0001
1117140 0000 0048 0000 da27 8400 0000 0000 4524 0000 0000 4400 0012 0000 4524 0000 da5b 4000 000c 0000 0018 0000 0000 4400 0012
1117220 0000 4534 0000 da6c 8000 0000 0000 0000 0000 da79 8000 0000 0000 0000 0000 0000 4400 0013 0000 4534 0000 0000 4400 0011
1117300 0000 4534 0000 0000 4400 0012 0000 4558 0000 0000 4400 0013 0000 458c 0000 da83 8000 0000 0000 0000 0000 da9e 2400 0004
1117360 0000 459c 0000 dabe a000 0008 0000 0044 0000 dace a000 0004 0000 0048 0000 dae8 8400 0000 0000 459c 0000 0000 4400 001b
1117440 0000 459c 0000 0000 4400 001b 0000 45b0 0000 db1b 8000 0000 0000 0000 0000 db28 8000 0000 0000 0000 0000 0000 4400 001c
1117520 0000 45b0 0000 0000 4400 001a 0000 45b0 0000 db36 8000 0000 0000 0000 0000 db54 2400 0004 0000 45cc 0000 db74 a000 0008
1117600 0000 0044 0000 db84 a000 0004 0000 0048 0000 0000 4400 001a 0000 45e0 0000 db96 8000 0000 0000 0000 0000 dba3 8000 0000
1117660 0000 0000 0000 0000 4400 001b 0000 45e0 0000 0000 4400 0019 0000 45e0 0000 dbb1 8000 0000 0000 0000 0000 dbcf 2400 0001
1117740 0000 45fc 0000 dbec a000 0008 0000 0044 0000 dbfc a000 0001 0000 0048 0000 dc0d a000 0008 0000 004c 0000 0000 4400 0019
1120020 0000 4618 0000 dc1e 8000 0000 0000 0000 0000 dc2b 8000 0000 0000 0000 0000 0000 4400 001a 0000 4618 0000 dc39 8000 0000
1120100 0000 0000 0000 0000 4400 001b 0000 4618 0000 0000 4400 0018 0000 4618 0000 dc47 8000 0000 0000 0000 0000 dc62 2400 0001
1120160 0000 4628 0000 dc7f a000 0008 0000 0044 0000 dc8f a000 0001 0000 0048 0000 dca0 a000 0004 0000 004c 0000 0000 4400 0018
1120240 0000 4640 0000 dcb0 8000 0000 0000 0000 0000 dcbd 8000 0000 0000 0000 0000 0000 4400 0019 0000 4640 0000 dccb 8000 0000
1120320 0000 0000 0000 0000 4400 001a 0000 4640 0000 0000 4400 0017 0000 4640 0000 dcd9 8000 0000 0000 0000 0000 dcf4 2400 0001
1120400 0000 4650 0000 dd12 a000 0008 0000 0044 0000 dd22 a000 0001 0000 0048 0000 dd33 a000 0001 0000 004c 0000 0000 4400 0017
1120460 0000 4668 0000 dd44 8000 0000 0000 0000 0000 dd51 8000 0000 0000 0000 0000 0000 4400 0018 0000 4668 0000 dd5f 8000 0000
1120540 0000 0000 0000 0000 4400 0019 0000 4668 0000 0000 4400 0016 0000 4668 0000 dd6d 8000 0000 0000 0000 0000 dd89 2400 0001
1120620 0000 4678 0000 dda7 a000 0008 0000 0044 0000 ddb7 a000 0001 0000 0048 0000 ddc8 a000 0004 0000 004c 0000 0000 4400 0016
```

```
1120700  0000 4690 0000 ddd8 8000 0000 0000 0000 0000 dde5 8000 0000 0000 0000 0000 0000 4400 0017 0000 4690 0000 ddf3 8000 0000
1120760  0000 0000 0000 0000 44c0 0018 0000 4690 0000 0000 4400 0015 0000 4690 0000 de01 8000 0000 0000 0000 0000 de1c 2400 0001
1121040  0000 46ac 0000 de38 a000 0008 0000 0044 0000 de48 a000 0004 0000 0048 0000 0000 4400 0015 0000 46c0 0000 de58 8000 0000
1121120  0000 0000 0000 de65 8000 0000 0000 0000 0000 0000 4400 0016 0000 46c0 0000 0000 4400 0014 0000 46c0 0000 de73 8000 0000
1121200  0000 0000 0000 de8c 2400 0004 000c 46dc 0000 dead a000 0004 0000 0044 0000 debe a000 0004 0000 0048 0000 ded0 8400 0000
1121260  0000 46dc 0000 0000 4400 0015 0000 46dc 0000 0000 4400 0015 0000 46f0 0000 df02 8000 0000 0000 0000 0000 df0f 8000 0000
1121340  0000 0000 0000 0000 4400 0016 0000 46f0 0000 0000 4400 0014 0000 46f0 0000 df1d 8000 0000 0000 0000 0000 df3c 0400 0000
1121420  0000 4710 0000 df45 0400 0000 0000 4c00 0000 df5c 0400 0000 0000 4c2c 0000 df73 040c 0000 0000 4cb0 0000 df88 0400 0000
1121500  0000 4710 0000 df99 0400 0000 0000 4c54 0000 dfb1 0800 0000 0004 9290 0000 dfc0 0400 0000 0000 4b88 0000 dfd7 0400 0000
1121560  0000 4c7c 0000 dfee 0400 0000 0000 4ce0 0000 e009 6400 0000 0000 4710 0000 e039 6400 0000 0000 4710 0000 e042 8400 0000
1121640  0000 4710 0000 e04d 8000 0000 0000 0000 0000 e077 8000 0000 0000 0000 0000 e091 8000 0000 0000 0000 0000 e0bc 8000 0000
1121720  0000 0000 0000 e0de 8000 0000 0000 0000 0000 e101 8000 0000 0000 0000 0000 e127 8000 0000 0000 0000 0000 e149 8000 0000
1122000  0000 0000 0000 e16a 8000 0000 0000 0000 0000 e183 8000 0000 0000 0000 0000 e19e 8000 0000 0000 0000 0000 e1b2 8000 0000
1122060  0000 0000 0000 e1c4 8000 0004 ffff fb05 0000 e1e2 8000 0008 ffff fb05 0000 e21f 8000 0001 ffff fb05 0000 e23c 8000 0004
1122140  ffff fb05 0000 e24a 8000 0004 ffff fb05 0000 e25b 8000 0004 ffff fb05 0000 e26c 8000 0004 ffff fb05 0000 e2e3 8000 0004
1122220  ffff fb05 0000 e37b 8000 0004 ffff fb05 0000 e3bf 8000 0004 ffff fb05 0000 e43f 8000 0004 ffff fb05 0000 e4b9 8000 0004
1122300  ffff fb05 0000 e4e7 8000 003c ffff fb05 0000 e5fe 8000 003c ffff fb05 0000 e6fa 2000 0004 0000 0000 0000 e711 2000 0004
1122360  0000 0000 0000 e72a 2000 0004 0000 0000 0000 e742 2000 0004 0000 0000 0000 e757 2000 0004 0000 0000 0000 e76d 2000 0001
1122440  0000 0000 0000 e786 8000 0000 0000 0000 0000 e84c 8000 0000 0000 0000 0000 e912 8000 0000 0000 0000 0000 e9d2 8000 0000
1122520  0000 0000 0000 ea26 8000 0028 ffff fb05 0000 eb47 8000 0028 ffff fb05 0000 ebac 8000 0000 0000 0000 0000 ec77 8000 0000
1122600  0000 0000 0000 ed42 8000 0000 0000 0000 0000 ee00 8000 0000 0000 0000 0000 eec4 8000 0000 0000 0000 0000 ef89 8000 0000
1122660  0000 0000 0000 efe8 8000 0048 ffff fb05 0000 f066 8000 0000 0000 0000 0000 f12a 8000 0000 0000 0000 0000 f1f4 8000 0000
1122740  0000 0000 0000 f2c9 8000 0000 0000 0000 0000 f395 8000 0000 0000 0000 0000 f433 8000 0044 ffff fb05 0000 f48a 8000 0000
1123020  0000 0000 0000 f550 8000 0000 0000 0000 0000 f61b 8000 0000 0000 0000 0000 f6e8 8000 0000 0000 0000 0000 f72a 2400 0044
1123100  0000 4710 0000 f74a a000 0044 0000 0044 0000 f75a a000 0001 0000 0048 0000 f766 8400 0000 0000 4710 0000 0000 4400 01d1
1123160  0000 4710 0000 f783 4000 0044 0000 0018 0000 0000 4400 01d1 0000 4720 0000 f793 8000 0000 0000 0000 0000 f7a0 8000 0000
1123240  0000 0000 0000 000c 4400 01d2 0000 4720 0000 0000 4400 01d3 0000 4754 0000 0000 4400 01d4 0000 47f8 0000 0000 4400 01d6
1123320  0000 4928 0000 0000 4400 01d8 0000 4858 0000 0000 4400 01d9 0000 4864 0000 f7aa 8000 0000 0000 0000 0000 f7bf 8000 0050
1123400  ffff fb05 0000 f83a 8000 0000 0000 0000 0000 f8c1 2000 0000 0000 0000 0000 f8e3 2000 0000 0000 0000 0000 f906 2000 0000
1123460  0000 0000 0000 f913 2000 0000 0000 0000 0000 f920 8000 0001 ffff fb05 0000 f95a 2000 0004 0000 0000 0000 f97c 2000 0004
1123540  0000 0000 0000 f39e 8000 0000 0000 0000 0000 fa2b 2800 0001 0004 9290 0000 fa41 8000 0004 ffff fb05 0000 fa4d 8000 0008
1123620  ffff fb05 0000 fab0 8000 0000 0000 0000 0000 fb2c 8000 0004 ffff fb05 0000 fb61 8000 0000 0000 0000 0000 fbb5 8000 0008
1123700  ffff fb05 0000 fc20 8000 0000 0000 0000 0000 fc86 8000 0004 ffff fb05 0000 fcbb 8000 0000 0000 0000 0000 fd17 8000 0008
1123760  ffff fb05 0000 fd7a 8000 0000 0000 0000 0000 fde0 8000 0004 ffff fb05 0000 fe15 8000 0000 0000 0000 0000 fe71 8000 0008
1124040  ffff fb05 0000 fedf 8000 0000 0000 0000 0000 ff6c 8000 0004 ffff fb05 0000 ffa3 8000 0000 0000 0000 0001 0005 8000 0008
1124120  ffff fb05 0001 005b 8000 0000 0000 0000 0001 00dc 8000 0004 ffff fb05 0001 0113 8000 0000 0000 0000 0001 016b 8000 0008
1124200  ffff fb05 0001 01c1 8000 0000 0000 0000 0001 022b 8000 0004 ffff fb05 0001 0262 8000 0000 0000 0000 0001 02c2 8000 0008
1124260  ffff fb05 0001 0318 8000 0000 0000 0000 0001 0382 8000 0004 ffff fb05 0001 03b9 8000 0000 0000 0000 0001 0419 8000 0008
1124340  ffff fb05 0001 0472 8000 0000 0000 0000 0001 0504 8000 0004 ffff fb05 0001 053d 8000 0000 0000 0000 0001 05a3 2000 0004
1124420  0000 0000 0001 05b0 2000 0004 0000 0000 0001 05c0 8000 0034 ffff fb05 0001 06d9 8000 0034 ffff fb05 0001 07bb 8000 0000
1124500  0000 0000 0001 0885 8000 0000 0000 0000 0001 09b2 8000 0040 ffff fb05 0001 09ca 8000 0040 ffff fb05 0001 0ae4 2000 0004
1124560  0000 0000 0001 0afe 8000 0000 0000 0000 0001 0bcb 8000 0000 0000 0000 0001 0c76 8000 0084 ffff fb05 0001 0cfb 8000 0000
1124640  0000 0000 0001 0dd0 8000 0000 0000 0000 0001 0e4c 8000 0004 ffff fb05 0001 0e60 8000 0004 ffff fb05 0001 0e8f 8000 0000
1124720  0000 0000 0001 0f14 2000 0008 0000 0000 0001 0f38 8000 0008 ffff fb05 0001 0f43 8000 0008 ffff fb05 0001 0f4f 8000 0008
1125000  ffff fb05 0001 0f5b 8000 0008 ffff fb05 0001 0fa7 8000 0000 0000 0000 0001 106d 8000 0000 0000 0000 0001 10cf 8000 0044
1125060  ffff fb05 0001 1131 8000 0000 0000 0000 0001 11f7 8000 0000 0000 0000 0001 1222 8000 0008 ffff fb05 0001 122e 8000 000c
1125140  ffff fb05 0001 12a1 8000 0000 0000 0000 0001 132d 8000 0008 ffff fb05 0001 1381 8000 0000 0000 0000 0001 1401 8000 000c
1125220  ffff fb05 0001 1477 8000 0000 0000 0000 0001 1522 2000 0008 0000 0000 0001 1548 8000 000c ffff fb05 0001 15ac 8000 0000
1125300  0000 0000 0001 166d 8000 0000 0000 0000 0001 16dd 2000 0008 0000 0000 0001 16ff 8000 000c ffff fb05 0001 1764 8000 0000
1125360  0000 0000 0001 1832 8000 0000 0000 0000 0001 18a0 2000 0008 0000 0000 0001 18c3 8000 0008 ffff fb05 0001 1924 8000 0000
1125440  0000 0000 0001 19cb 8000 0004 ffff fb05 0001 1a07 8000 0004 ffff fb05 0001 1a48 8000 0004 ffff fb05 0001 1a86 8000 0004
1125520  ffff fb05 0001 1ac1 8000 0004 ffff fb05 0001 1aff 8000 0004 ffff fb05 0001 1b21 8000 0004 ffff fb05 0001 1b43 2000 0001
1125600  0000 0000 0001 1b52 8000 003c ffff fb05 0001 1c53 8000 003c ffff fb05 0001 1cb8 8000 0000 0000 0000 0001 1d7e 8000 0000
1125660  0000 0000 0001 1e3b 8000 0000 0000 0000 0001 1ece 2000 0008 0000 0000 0001 1ef2 2400 0001 0000 4874 0001 1f15 a000 003c
1125740  0000 0044 0001 1f2d a000 0001 0000 0048 0001 1f3a 8400 0000 0000 4874 0000 0000 4400 0009 0000 4874 0001 1f45 4000 003c
```

| | | | | | | | | | | | | | | | | | | | | | | | | |
|---|---|---|---|---|---|---|---|---|---|---|---|---|---|---|---|---|---|---|---|---|---|---|---|---|
| 1126020 | 0000 | 0018 | 0000 | 0000 | 4400 | 0009 | 0000 | 4884 | 0001 | 1f55 | 8000 | 0000 | 0000 | 0000 | 0001 | 1f62 | 8000 | 0000 | 0000 | 0000 | 0000 | 0000 | 4400 | 000a |
| 1126100 | 0000 | 4884 | 0000 | 0000 | 4400 | 000b | 0000 | 48a4 | 0000 | 0000 | 4400 | 000c | 0000 | 48b4 | 0000 | 0000 | 4400 | 000d | 0000 | 48d4 | 0000 | 0000 | 4400 | 000f |
| 1126160 | 0000 | 48e4 | 0000 | 0000 | 4400 | 0010 | 0000 | 4900 | 0000 | 0000 | 4400 | 0012 | 0000 | 4908 | 0001 | 1f6c | 8000 | 0000 | 0000 | 0000 | 0001 | 1f8d | 2400 | 0001 |
| 1126240 | 0000 | 4918 | 0001 | 1fa8 | a000 | 003c | 0000 | 0044 | 0001 | 1fb8 | a000 | 0001 | 0000 | 0048 | 0000 | 0000 | 4400 | 0015 | 0000 | 4918 | 0001 | 1fc5 | 4000 | 003c |
| 1126320 | 0000 | 0018 | 0000 | 0000 | 4400 | 0015 | 0000 | 4928 | 0001 | 1fd5 | 8000 | 0000 | 0000 | 0000 | 0001 | 1fe2 | 8000 | 0000 | 0000 | 0000 | 0000 | 0000 | 4400 | 0016 |
| 1126400 | 0000 | 4928 | 0000 | 0000 | 4400 | 0017 | 0000 | 4968 | 0000 | 0000 | 4400 | 0018 | 0000 | 498c | 0000 | 0000 | 4400 | 0019 | 0000 | 49d0 | 0000 | 0000 | 4400 | 001a |
| 1126460 | 0000 | 4a04 | 0000 | 0000 | 4400 | 001b | 0000 | 4a44 | 0001 | 1fec | 8000 | 0000 | 0000 | 0000 | 0001 | 2005 | 2400 | 0004 | 0000 | 4a54 | 0001 | 2024 | a000 | 003c |
| 1126540 | 0000 | 0044 | 0001 | 2034 | a000 | 0004 | 0000 | 0048 | 0000 | 0000 | 4400 | 001e | 0000 | 4a54 | 0001 | 2049 | 4000 | 003c | 0000 | 0018 | 0000 | 0000 | 4400 | 001e |
| 1126620 | 0000 | 4a64 | 0001 | 2059 | 8000 | 0000 | 0000 | 0000 | 0001 | 2066 | 8000 | 0000 | 000c | 0000 | 0000 | 0000 | 4400 | 001f | 0000 | 4a64 | 0000 | 0000 | 4400 | 0020 |
| 1126700 | 0000 | 4a64 | 0000 | 0000 | 4400 | 0021 | 0000 | 4a80 | 0000 | 0000 | 4400 | 0022 | 0000 | 4a98 | 0000 | 0000 | 4400 | 0024 | 0000 | 4aa4 | 0000 | 0000 | 4400 | 0025 |
| 1126760 | 0000 | 4ab0 | 0001 | 2070 | 8000 | 0000 | 0000 | 0000 | 0001 | 208d | 2400 | 0004 | 0000 | 4ac0 | 0001 | 20ac | a000 | 003c | 0000 | 0044 | 0001 | 20bc | a000 | 0004 |
| 1127040 | 0000 | 0048 | 0000 | 0000 | 4400 | 0028 | 0000 | 4ac0 | 0001 | 20c9 | 4000 | 003c | 0000 | 0018 | 0000 | 0000 | 4400 | 0028 | 0000 | 4ad0 | 0001 | 20d9 | 8000 | 0000 |
| 1127120 | 0000 | 0000 | 0001 | 20e6 | 8000 | 0000 | 0000 | 000c | 0000 | 0000 | 4400 | 0029 | 0000 | 4ad0 | 0000 | 0000 | 4400 | 002a | 0000 | 4aec | 0000 | 0000 | 4400 | 002b |
| 1127200 | 0000 | 4b04 | 0000 | 0000 | 4400 | 002d | 0000 | 4b10 | 0000 | 0000 | 4400 | 002e | 0000 | 4b1c | 0001 | 20f0 | 8000 | 0000 | 0000 | 0000 | 0001 | 210d | 2400 | 0001 |
| 1127260 | 0000 | 4b2c | 0001 | 2137 | 8400 | 0000 | 0000 | 4b2c | 0000 | 0000 | 4400 | 023b | 0000 | 4b2c | 0000 | 0000 | 4400 | 023b | 0000 | 4b38 | 0000 | 0000 | 4400 | 023c |
| 1127340 | 0000 | 4b48 | 0001 | 2154 | 2400 | 0001 | 0000 | 4b58 | 0000 | 0000 | 4400 | 023b | 0000 | 4b58 | 0000 | 0000 | 4400 | 023b | 0000 | 4b64 | 0000 | 0000 | 4400 | 023c |
| 1127420 | 0000 | 4b78 | 0001 | 217e | 2000 | 0008 | 0000 | 0000 | 0001 | 21aa | 2000 | 0008 | 0000 | 0000 | 0001 | 21e3 | 2400 | 0001 | 0000 | 4b88 | 0001 | 2200 | a000 | 000c |
| 1127500 | 0000 | 0044 | 0001 | 2218 | a000 | 0001 | 0000 | 0048 | 0001 | 2225 | 8400 | 0000 | 0000 | 4b88 | 0000 | 0000 | 4400 | 0012 | 0000 | 4b88 | 0001 | 2259 | 4000 | 000c |
| 1127560 | 0000 | 0018 | 0000 | 0000 | 4400 | 0012 | 0000 | 4b98 | 0001 | 2269 | 8000 | 0000 | 0000 | 0000 | 0001 | 2276 | 8000 | 0000 | 0000 | 0000 | 0000 | 0000 | 4400 | 0013 |
| 1127640 | 0000 | 4b98 | 0000 | 0000 | 4400 | 0011 | 0000 | 4b98 | 0000 | 0000 | 4400 | 0012 | 0000 | 4bbc | 0000 | 0000 | 4400 | 0013 | 0000 | 4bf0 | 0001 | 2280 | 8000 | 0000 |
| 1127720 | 0000 | 0000 | 0001 | 229b | 2400 | 0001 | 0000 | 4c00 | 0001 | 22b8 | a000 | 0008 | 0000 | 0044 | 0001 | 22c8 | a000 | 0001 | 0000 | 0048 | 0001 | 22d9 | a000 | 0008 |
| 1130000 | 0000 | 004c | 0001 | 22ea | 8400 | 0000 | 0000 | 4c00 | 0000 | 0000 | 4400 | 0019 | 0000 | 4c00 | 0000 | 0000 | 4400 | 0019 | 0000 | 4c1c | 0001 | 231d | 8000 | 0000 |
| 1130060 | 0000 | 0000 | 0001 | 232a | 8000 | 0000 | 0000 | 0000 | 0000 | 0000 | 4400 | 001a | 0000 | 4c1c | 0001 | 2338 | 8000 | 0000 | 0000 | 0000 | 0000 | 0000 | 4400 | 001b |
| 1130140 | 0000 | 4c1c | 0000 | 0000 | 4400 | 0018 | 0000 | 4c1c | 0001 | 2346 | 8000 | 0000 | 0000 | 0000 | 0001 | 2361 | 2400 | 0001 | 0000 | 4c2c | 0001 | 237e | a000 | 0008 |
| 1130220 | 0000 | 0044 | 0001 | 238e | a000 | 0001 | 0000 | 0048 | 0001 | 239f | a000 | 0004 | 0000 | 004c | 0000 | 0000 | 4400 | 0018 | 0000 | 4c44 | 0001 | 23af | 8000 | 0000 |
| 1130300 | 0000 | 0000 | 0001 | 23bc | 8000 | 0000 | 0000 | 0000 | 0000 | 0000 | 4400 | 0019 | 0000 | 4c44 | 0001 | 23ca | 8000 | 0000 | 0000 | 0000 | 0000 | 0000 | 4400 | 001a |
| 1130360 | 0000 | 4c44 | 0000 | 0000 | 4400 | 0017 | 0000 | 4c44 | 0001 | 23d8 | 8000 | 0000 | 0000 | 0000 | 0001 | 23f3 | 2400 | 0001 | 0000 | 4c54 | 0001 | 2411 | a000 | 0008 |
| 1130440 | 0000 | 0044 | 0001 | 2421 | a000 | 0001 | 0000 | 0048 | 0001 | 2432 | a000 | 0001 | 0000 | 004c | 0000 | 0000 | 4400 | 0017 | 0000 | 4c6c | 0001 | 2443 | 8000 | 0000 |
| 1130520 | 0000 | 0000 | 0001 | 2450 | 8000 | 0000 | 0000 | 0000 | 0000 | 0000 | 4400 | 0018 | 0000 | 4c6c | 0001 | 245e | 8000 | 0000 | 0000 | 0000 | 0000 | 0000 | 4400 | 0019 |
| 1130600 | 0000 | 4c6c | 0000 | 0000 | 4400 | 0016 | 0000 | 4c6c | 0001 | 246c | 8000 | 0000 | 0000 | 0000 | 0001 | 2488 | 2400 | 0001 | 0000 | 4c7c | 0001 | 24a6 | a000 | 0008 |
| 1130660 | 0000 | 0044 | 0001 | 24b6 | a000 | 0001 | 0000 | 0048 | 0001 | 24c7 | a000 | 0004 | 0000 | 004c | 0000 | 0000 | 4400 | 0016 | 0000 | 4c94 | 0001 | 24d7 | 8000 | 0000 |
| 1130740 | 0000 | 0000 | 0001 | 24e4 | 8000 | 0000 | 0000 | 0000 | 0000 | 0000 | 4400 | 0017 | 0000 | 4c94 | 0001 | 24f2 | 8000 | 0000 | 0000 | 0000 | 0000 | 0000 | 4400 | 0018 |
| 1131020 | 0000 | 4c94 | 0000 | 0000 | 4400 | 0015 | 0000 | 4c94 | 0001 | 2500 | 8000 | 0000 | 0000 | 0000 | 0001 | 251b | 2400 | 0001 | 0000 | 4cb0 | 0001 | 2537 | a000 | 0008 |
| 1131100 | 0000 | 0044 | 0001 | 2547 | a000 | 0004 | 0000 | 0048 | 0000 | 0000 | 4400 | 0015 | 0000 | 4cc4 | 0001 | 2557 | 8000 | 0000 | 0000 | 0000 | 0001 | 2564 | 8000 | 0000 |
| 1131160 | 0000 | 0000 | 0000 | 0000 | 4400 | 0016 | 0000 | 4cc4 | 0000 | 0000 | 4400 | 0014 | 0000 | 4cc4 | 0001 | 2572 | 8000 | 0000 | 0000 | 0000 | 0001 | 258b | 2400 | 0004 |
| 1131240 | 0000 | 4ce0 | 0001 | 25ac | a000 | 0004 | 0000 | 0044 | 0001 | 25bc | a000 | 0004 | 0000 | 0048 | 0001 | 25cd | 8400 | 0000 | 0000 | 4ce0 | 0000 | 0000 | 4400 | 0015 |
| 1131320 | 0000 | 4ce0 | 0000 | 0000 | 4400 | 0015 | 0000 | 4cf4 | 0001 | 25ff | 8000 | 0000 | 0000 | 0000 | 0001 | 260c | 8000 | 0000 | 0000 | 0000 | 0000 | 0000 | 4400 | 0016 |
| 1131400 | 0000 | 4cf4 | 0000 | 0000 | 4400 | 0014 | 0000 | 4cf4 | 0001 | 261a | 8000 | 0000 | 0000 | 0000 | 0001 | 2639 | 0400 | 0000 | 0000 | 4d10 | 0001 | 2645 | 0400 | 0000 |
| 1131460 | 0000 | 500c | 0001 | 265c | 0400 | 0000 | 0000 | 5038 | 0001 | 2673 | 0400 | 0000 | 0000 | 4ed0 | 0001 | 2693 | 0400 | 0000 | 0000 | 50bc | 0001 | 26a8 | 0400 | 0000 |
| 1131540 | 0000 | 4d10 | 0001 | 26b9 | 0400 | 0000 | 0000 | 5060 | 0001 | 26d1 | 0800 | 0000 | 0004 | 9298 | 0001 | 26e0 | 0400 | 0000 | 0000 | 4fac | 0001 | 26fa | 0400 | 0000 |
| 1131620 | 0000 | 4fdc | 0001 | 2714 | 0400 | 0000 | 0000 | 4f34 | 0001 | 272b | 0400 | 0000 | 0000 | 5088 | 0001 | 2742 | 0400 | 0000 | 0000 | 50ec | 0001 | 275d | 6400 | 0000 |
| 1131700 | 0000 | 4d10 | 0001 | 278d | 6400 | 0000 | 0000 | 4d10 | 0001 | 2799 | 8400 | 0000 | 0000 | 4d10 | 0001 | 27a7 | 8000 | 0000 | 0000 | 0000 | 0001 | 27d1 | 8000 | 0000 |
| 1131760 | 0000 | 0000 | 0001 | 27eb | 8000 | 0000 | 0000 | 0000 | 0001 | 2816 | 8000 | 0000 | 0000 | 0000 | 0001 | 2838 | 8000 | 0000 | 0000 | 0000 | 0001 | 285b | 8000 | 0000 |
| 1132040 | 0000 | 0000 | 0001 | 2881 | 8000 | 0000 | 0000 | 0000 | 0001 | 28a3 | 8000 | 0000 | 0000 | 0000 | 0001 | 28c4 | 8000 | 0000 | 0000 | 0000 | 0001 | 28dd | 8000 | 0000 |
| 1132120 | 0000 | 0000 | 0001 | 28f8 | 8000 | 0000 | 0000 | 0000 | 0001 | 290c | 8000 | 0000 | 0000 | 0000 | 0001 | 291e | 8000 | 0004 | ffff | fb05 | 0001 | 293c | 8000 | 0008 |
| 1132200 | ffff | fb05 | 0001 | 2979 | 8000 | 0001 | ffff | fb05 | 0001 | 2996 | 8000 | 0004 | ffff | fb05 | 0001 | 29a4 | 8000 | 0004 | ffff | fb05 | 0001 | 29b5 | 8000 | 0004 |
| 1132260 | ffff | fb05 | 0001 | 29c6 | 8000 | 0004 | ffff | fb05 | 0001 | 2a3d | 8000 | 0004 | ffff | fb05 | 0001 | 2ad5 | 8000 | 0004 | ffff | fb05 | 0001 | 2b19 | 8000 | 0004 |
| 1132340 | ffff | fb05 | 0001 | 2b99 | 8000 | 0004 | ffff | fb05 | 0001 | 2c13 | 8000 | 0004 | ffff | fb05 | 0001 | 2c41 | 8000 | 003c | ffff | fb05 | 0001 | 2d58 | 8000 | 003c |
| 1132420 | ffff | fb05 | 0001 | 2e54 | 2000 | 0004 | 0000 | 0000 | 0001 | 2e6b | 2000 | 0004 | 0000 | 0000 | 0001 | 2e84 | 2000 | 0004 | 0000 | 0000 | 0001 | 2e9c | 2000 | 0004 |
| 1132500 | 0000 | 0000 | 0001 | 2eb1 | 2000 | 0004 | 0000 | 0000 | 0001 | 2ec7 | 2000 | 0001 | 0000 | 0000 | 0001 | 2ee0 | 8000 | 0000 | 0000 | 0000 | 0001 | 2fa6 | 8000 | 0000 |
| 1132560 | 0000 | 0000 | 0001 | 306c | 8000 | 0000 | 000c | 0000 | 0001 | 312c | 8000 | 0000 | 0000 | 0000 | 0001 | 3180 | 8000 | 0028 | ffff | fb05 | 0001 | 32a1 | 8000 | 0028 |
| 1132640 | ffff | fb05 | 0001 | 3306 | 8000 | 0000 | 0000 | 000c | 0001 | 33d1 | 8000 | 0000 | 0000 | 0000 | 0001 | 349c | 8000 | 0000 | 0000 | 0000 | 0001 | 355a | 8000 | 0000 |
| 1132720 | 0000 | 0000 | 0001 | 351e | 8000 | 0000 | 0000 | 0000 | 0001 | 36e3 | 8000 | 0000 | 0000 | 0000 | 0001 | 3742 | 8000 | 0048 | ffff | fb05 | 0001 | 37c0 | 8000 | 0000 |
| 1133000 | 0000 | 0000 | 0001 | 3984 | 8000 | 0000 | 0000 | 0000 | 0001 | 394e | 8000 | 0000 | 0000 | 0000 | 0001 | 3a23 | 8000 | 0000 | 0000 | 0000 | 0001 | 3aef | 8000 | 0000 |
| 1133060 | 0000 | 0000 | 0001 | 3b8d | 8000 | 0044 | ffff | fb05 | 0001 | 3be4 | 8000 | 0000 | 0000 | 0000 | 0001 | 3caa | 8000 | 0000 | 0000 | 0000 | 0001 | 3d75 | 8000 | 0000 |

| | | | | | | | | | | | | | | | | | | | | | | | | |
|---|---|---|---|---|---|---|---|---|---|---|---|---|---|---|---|---|---|---|---|---|---|---|---|---|
| 1133140 | 0000 | 0000 | 0001 | 3e42 | 8000 | 0000 | 0000 | 0000 | 0001 | 3e84 | 2400 | 0044 | 0000 | 4d10 | 0001 | 3ea4 | a000 | 0044 | 0000 | 0044 | 0001 | 3eb4 | a000 | 0001 |
| 1133220 | 0000 | 0048 | 0001 | 3ec0 | 8400 | 0000 | 0000 | 4d10 | 0000 | 0000 | 4400 | 01d1 | 0000 | 4d10 | 0001 | 3edd | 4000 | 0044 | 0000 | 0018 | 0000 | 0000 | 4400 | 01d1 |
| 1133300 | 0000 | 4d20 | 0001 | 3eed | 8000 | 0000 | 0000 | 0000 | 0001 | 3efa | 8000 | 0000 | 0000 | 0000 | 0000 | 0000 | 4400 | 01d2 | 0000 | 4d20 | 0000 | 0000 | 4400 | 01d3 |
| 1133360 | 0000 | 4d54 | 0000 | 0000 | 4400 | 01d4 | 0000 | 4df8 | 0000 | 0000 | 4400 | 01d6 | 0000 | 4e28 | 0000 | 0000 | 4400 | 01d8 | 0000 | 4e58 | 0000 | 0000 | 4400 | 01d9 |
| 1133440 | 0000 | 4e64 | 0001 | 3f04 | 8000 | 0000 | 0000 | 0000 | 0001 | 3f19 | 8000 | 0050 | ffff | fb05 | 0001 | 3f94 | 8000 | 0000 | 0000 | 0000 | 0001 | 401b | 2000 | 0000 |
| 1133520 | 0000 | 0000 | 0001 | 403d | 2000 | 0000 | 0000 | 0000 | 0001 | 4060 | 2000 | 0000 | 0000 | 0000 | 0001 | 406d | 2000 | 0000 | 0000 | 0000 | 0001 | 407a | 8000 | 0001 |
| 1133600 | ffff | fb05 | 0001 | 40b4 | 2000 | 0004 | 0000 | 0000 | 0001 | 40d6 | 2000 | 0004 | 0000 | 0000 | 0001 | 40f8 | 8000 | 0000 | 0000 | 0000 | 0001 | 4185 | 2800 | 0001 |
| 1133660 | 0004 | 9298 | 0001 | 419b | 8000 | 0004 | ffff | fb05 | 0001 | 41a7 | 8000 | 0008 | ffff | fb05 | 0001 | 420a | 8000 | 0000 | 0000 | 0000 | 0001 | 4286 | 8000 | 0004 |
| 1133740 | ffff | fb05 | 0001 | 42bb | 8000 | 0000 | 0000 | 0000 | 0001 | 430f | 8000 | 0008 | ffff | fb05 | 0001 | 437a | 8000 | 0000 | 0000 | 0000 | 0001 | 43e0 | 8000 | 0004 |
| 1134020 | ffff | fb05 | 0001 | 4415 | 8000 | 0000 | 0000 | 0000 | 0001 | 4471 | 8000 | 0008 | ffff | fb05 | 0001 | 44d4 | 8000 | 0000 | 0000 | 0000 | 0001 | 453a | 8000 | 0004 |
| 1134100 | ffff | fb05 | 0001 | 456f | 8000 | 0000 | 0000 | 0000 | 0001 | 45cb | 8000 | 0008 | ffff | fb05 | 0001 | 4639 | 8000 | 0000 | 0000 | 0000 | 0001 | 46c6 | 8000 | 0004 |
| 1134160 | ffff | fb05 | 0001 | 46fd | 8000 | 0000 | 0000 | 0000 | 0001 | 475f | 8000 | 0008 | ffff | fb05 | 0001 | 47b5 | 8000 | 0000 | 0000 | 0000 | 0001 | 4836 | 8000 | 0004 |
| 1134240 | ffff | fb05 | 0001 | 496d | 8000 | 0000 | 0000 | 0000 | 0001 | 48c5 | 8000 | 0008 | ffff | fb05 | 0001 | 491b | 8000 | 0000 | 0000 | 0000 | 0001 | 4985 | 8000 | 0004 |
| 1134320 | ffff | fb05 | 0001 | 49bc | 8000 | 0000 | 0000 | 0000 | 0001 | 4a1c | 8000 | 0008 | ffff | fb05 | 0001 | 4a72 | 8000 | 0000 | 0000 | 0000 | 0001 | 4adc | 8000 | 0004 |
| 1134400 | ffff | fb05 | 0001 | 4b13 | 8000 | 0000 | 0000 | 0000 | 0001 | 4b73 | 8000 | 0008 | ffff | fb05 | 0001 | 4bcc | 8000 | 0000 | 0000 | 0000 | 0001 | 4c5e | 8000 | 0004 |
| 1134460 | ffff | fb05 | 0001 | 4c97 | 8000 | 0000 | 0000 | 0000 | 0001 | 4cfd | 2000 | 0004 | 0000 | 0000 | 0001 | 4d0a | 2000 | 0004 | 0000 | 0000 | 0001 | 4d1a | 8000 | 0034 |
| 1134540 | ffff | fb05 | 0001 | 4e33 | 8000 | 0034 | ffff | fb05 | 0001 | 4f15 | 8000 | 0000 | 0000 | 0000 | 0001 | 4fdf | 8000 | 0000 | 0000 | 0000 | 0001 | 500c | 8000 | 0040 |
| 1134620 | ffff | fb05 | 0001 | 5124 | 8000 | 0040 | ffff | fb05 | 0001 | 523e | 2000 | 0004 | 0000 | 0000 | 0001 | 5258 | 8000 | 0000 | 0000 | 0000 | 0001 | 5325 | 8000 | 0000 |
| 1134700 | 0000 | 0000 | 0001 | 53d0 | 8000 | 0094 | ffff | fb05 | 0001 | 5455 | 8000 | 0000 | 0000 | 0000 | 0001 | 552a | 8000 | 0000 | 0000 | 0000 | 0001 | 55a6 | 8000 | 0004 |
| 1134760 | ffff | fb05 | 0001 | 55ba | 8000 | 0004 | ffff | fb05 | 0001 | 55f6 | 8000 | 0004 | ffff | fb05 | 0001 | 5637 | 8000 | 0004 | ffff | fb05 | 0001 | 5675 | 8000 | 0004 |
| 1135040 | ffff | fb05 | 0001 | 56b0 | 8000 | 0004 | ffff | fb05 | 0001 | 56ee | 8000 | 0004 | ffff | fb05 | 0001 | 5710 | 8000 | 0004 | ffff | fb05 | 0001 | 5732 | 2000 | 0001 |
| 1135120 | 0000 | 0000 | 0001 | 5741 | 8000 | 0004 | ffff | fb05 | 0001 | 5770 | 8000 | 0000 | 0000 | 0000 | 0001 | 57f5 | 2000 | 0008 | 0000 | 0000 | 0001 | 581c | 8000 | 0008 |
| 1135200 | ffff | fb05 | 0001 | 5827 | 8000 | 0008 | ffff | fb05 | 0001 | 5833 | 8000 | 0008 | ffff | fb05 | 0001 | 583f | 8000 | 0008 | ffff | fb05 | 0001 | 588b | 8000 | 0000 |
| 1135260 | 0000 | 0000 | 0001 | 5951 | 8000 | 0000 | 0000 | 0000 | 0001 | 59b3 | 8000 | 0044 | ffff | fb05 | 0001 | 5a15 | 8000 | 0000 | 0000 | 0000 | 0001 | 5adb | 8000 | 0000 |
| 1135340 | 0000 | 0000 | 0001 | 5b06 | 8000 | 0008 | ffff | fb05 | 0001 | 5b12 | 8000 | 000c | ffff | fb05 | 0001 | 5b85 | 8000 | 0000 | 0000 | 0000 | 0001 | 5c11 | 8000 | 0008 |
| 1135420 | ffff | fb05 | 0001 | 5c65 | 8000 | 0000 | 0000 | 0000 | 0001 | 5ce5 | 8000 | 000c | ffff | fb05 | 0001 | 5d5b | 8000 | 0000 | 0000 | 0000 | 0001 | 5e06 | 2000 | 0008 |
| 1135500 | 0000 | 0000 | 0001 | 5e2f | 8000 | 0004 | ffff | fb05 | 0001 | 5e78 | 8000 | 0000 | 0000 | 0000 | 0001 | 5e8b | 8000 | 0010 | ffff | fb05 | 0001 | 5f14 | 8000 | 0000 |
| 1135560 | 0000 | 0000 | 0001 | 5fd8 | 8000 | 0000 | 0000 | 0000 | 0001 | 6097 | 8000 | 0000 | 0000 | 0000 | 0001 | 60ae | 2000 | 0008 | 0000 | 0000 | 0001 | 60d7 | 8000 | 001c |
| 1135640 | ffff | fb05 | 0001 | 617b | 8000 | 0000 | 0000 | 0000 | 0001 | 6253 | 8000 | 0000 | 0000 | 0000 | 0001 | 6327 | 8000 | 0000 | 0000 | 0000 | 0001 | 63fd | 8000 | 0000 |
| 1135720 | 0000 | 0000 | 0001 | 6420 | 2000 | 0008 | 0000 | 0000 | 0001 | 6452 | 2400 | 0001 | 0000 | 4e74 | 0000 | 0000 | 4400 | 023b | 0000 | 4e74 | 0000 | 0000 | 4400 | 023b |
| 1136000 | 0000 | 4e80 | 0000 | 0000 | 4400 | 023c | 0000 | 4e90 | 0001 | 646f | 2400 | 0001 | 0000 | 4ea0 | 0000 | 0000 | 4400 | 023b | 0000 | 4ea0 | 0000 | 0000 | 4400 | 023b |
| 1136060 | 0000 | 4eac | 0000 | 0000 | 4400 | 023c | 0000 | 4ec0 | 0001 | 648c | 2000 | 0008 | 0000 | 0000 | 0001 | 64d2 | 2000 | 0008 | 0000 | 0000 | 0001 | 650e | 2400 | 0001 |
| 1136140 | 0000 | 4ed0 | 0001 | 6534 | a000 | 001c | 0000 | 0044 | 0001 | 654c | a000 | 0001 | 0000 | 0048 | 0001 | 6559 | 8400 | 0000 | 0000 | 4ed0 | 0000 | 0000 | 4400 | 001c |
| 1136220 | 0000 | 4ed0 | 0001 | 656d | 4000 | 001c | 0000 | 0018 | 0000 | 0000 | 4400 | 001c | 0000 | 4ee0 | 0001 | 657d | 8000 | 0000 | 0000 | 0000 | 0001 | 658a | 8000 | 0000 |
| 1136300 | 0000 | 0000 | 0000 | 0000 | 4400 | 001d | 0000 | 4ee0 | 0000 | 0000 | 4400 | 001c | 0000 | 4ee0 | 0000 | 0000 | 4400 | 001d | 0000 | 4f24 | 0001 | 6594 | 8000 | 0000 |
| 1136360 | 0000 | 0000 | 0001 | 65b8 | 2400 | 0001 | 0000 | 4f34 | 0001 | 65d5 | a000 | 000c | 0000 | 0044 | 0001 | 65ed | a000 | 0001 | 0000 | 0048 | 0001 | 65fa | 8400 | 0000 |
| 1136440 | 0000 | 4f34 | 0000 | 0000 | 4400 | 0012 | 0000 | 4f34 | 0001 | 662e | 4000 | 000c | 0000 | 0018 | 0000 | 0000 | 4400 | 0012 | 0000 | 4f44 | 0001 | 663e | 8000 | 0000 |
| 1136520 | 0000 | 0000 | 0001 | 664b | 8000 | 0000 | 0000 | 0000 | 0000 | 0000 | 4400 | 0013 | 0000 | 4f44 | 0000 | 0000 | 4400 | 0011 | 0000 | 4f44 | 0000 | 0000 | 4400 | 0012 |
| 1136600 | 0000 | 4f68 | 0000 | 0000 | 4400 | 0013 | 0000 | 4f9c | 0001 | 6655 | 8000 | 0000 | 0000 | 0000 | 0001 | 6670 | 2400 | 0004 | 0000 | 4fac | 0001 | 6690 | a000 | 0008 |
| 1136660 | 0000 | 0044 | 0001 | 66a0 | a000 | 0004 | 0000 | 0048 | 0001 | 66b9 | 8400 | 0000 | 0000 | 4fac | 0000 | 0000 | 4400 | 001b | 0000 | 4fac | 0000 | 0000 | 4400 | 001b |
| 1136740 | 0000 | 4fc0 | 0001 | 66ec | 8000 | 0000 | 0000 | 0000 | 0001 | 66f9 | 8000 | 0000 | 0000 | 0000 | 0000 | 0000 | 4400 | 001c | 0000 | 4fc0 | 0000 | 0000 | 4400 | 001a |
| 1137020 | 0000 | 4fc0 | 0001 | 6707 | 8000 | 0000 | 0000 | 0000 | 0001 | 6725 | 2400 | 0004 | 0000 | 4fdc | 0001 | 6745 | a000 | 0008 | 0000 | 0044 | 0001 | 6755 | a000 | 0004 |
| 1137100 | 0000 | 0048 | 0000 | 0000 | 4400 | 001a | 0000 | 4ff0 | 0001 | 6766 | 8000 | 0000 | 0000 | 0000 | 0001 | 6773 | 8000 | 0000 | 0000 | 0000 | 0000 | 0000 | 4400 | 001b |
| 1137160 | 0000 | 4ff0 | 0000 | 0000 | 4400 | 0019 | 0000 | 4ff0 | 0001 | 6781 | 8000 | 0000 | 0000 | 0000 | 0001 | 679f | 2400 | 0001 | 0000 | 500c | 0001 | 67bc | a000 | 0008 |
| 1137240 | 0000 | 0044 | 0001 | 67cc | a000 | 0001 | 0000 | 0048 | 0001 | 67dd | a000 | 0008 | 0000 | 004c | 0000 | 0000 | 4400 | 0019 | 0000 | 5028 | 0001 | 67ee | 8000 | 0000 |
| 1137320 | 0000 | 0000 | 0001 | 67fb | 8000 | 0000 | 0000 | 0000 | 0000 | 0000 | 4400 | 001a | 0000 | 5028 | 0001 | 6809 | 8000 | 0000 | 0000 | 0000 | 0000 | 0000 | 4400 | 001b |
| 1137400 | 0000 | 5028 | 0000 | 0000 | 4400 | 0018 | 0000 | 5028 | 0001 | 6817 | 8000 | 0000 | 0000 | 0000 | 0001 | 6832 | 2400 | 0001 | 0000 | 5038 | 0001 | 684f | a000 | 0008 |
| 1137460 | 0000 | 0044 | 0001 | 685f | a000 | 0001 | 0000 | 0048 | 0001 | 6870 | a000 | 0004 | 0000 | 004c | 0000 | 0000 | 4400 | 0018 | 0000 | 5050 | 0001 | 6880 | 8000 | 0000 |
| 1137540 | 0000 | 0000 | 0001 | 688d | 8000 | 0000 | 0000 | 0000 | 0000 | 0000 | 4400 | 0019 | 0000 | 5050 | 0001 | 689b | 8000 | 0000 | 0000 | 0000 | 0000 | 0000 | 4400 | 001a |
| 1137620 | 0000 | 5050 | 0000 | 0000 | 4400 | 0017 | 0000 | 5050 | 0001 | 68a9 | 8000 | 0000 | 0000 | 0000 | 0001 | 68c4 | 2400 | 0001 | 0000 | 5060 | 0001 | 68e2 | a000 | 0008 |
| 1137700 | 0000 | 0044 | 0001 | 68f2 | a000 | 0001 | 0000 | 0048 | 0001 | 6903 | a000 | 0001 | 0000 | 004c | 0000 | 0000 | 4400 | 0017 | 0000 | 5078 | 0001 | 6914 | 8000 | 0000 |
| 1137760 | 0000 | 0000 | 0001 | 6921 | 8000 | 0000 | 0000 | 0000 | 0000 | 0000 | 4400 | 0018 | 0000 | 5078 | 0001 | 692f | 8000 | 0000 | 0000 | 0000 | 0000 | 0000 | 4400 | 0019 |
| 1140040 | 0000 | 5078 | 0000 | 0000 | 4400 | 0016 | 0000 | 5078 | 0001 | 693d | 8000 | 0000 | 0000 | 0000 | 0001 | 6959 | 2400 | 0001 | 0000 | 5088 | 0001 | 6977 | a000 | 0008 |
| 1140120 | 0000 | 0044 | 0001 | 6997 | a000 | 0001 | 0000 | 0048 | 0001 | 6998 | a000 | 0004 | 0000 | 004c | 0000 | 0000 | 4400 | 0016 | 0000 | 50a0 | 0001 | 69a8 | 8000 | 0000 |
| 1140200 | 0000 | 0000 | 0001 | 69b5 | 8000 | 0000 | 0000 | 0000 | 0000 | 0000 | 4400 | 0017 | 0000 | 50a0 | 0001 | 69c3 | 8000 | 0000 | 0000 | 0000 | 0000 | 0000 | 4400 | 0018 |

```
1140260  0000 50a0 0000 0000 4400 0015 0000 50a0 0001 69d1 8000 0000 0000 0000 0001 69ec 2400 0001 0000 50bc 0001 6a08 a000 0008
1140340  0000 0044 0001 6a18 a000 0004 0000 0048 0000 0000 4400 0015 0000 50d0 0001 6a28 8000 0000 0000 0000 0001 6a35 8000 0000
1140420  0000 0000 0000 0000 4400 0016 0000 50d0 0000 0000 4400 0014 0000 50d0 0001 6a43 8000 0000 0000 0000 0001 6a5c 2400 0004
1140500  0000 50ec 0001 6a7d a000 0004 0000 0044 0001 6a8d a000 0004 0000 0048 0001 6a9e 8400 0000 0000 50ec 0000 0000 4400 0015
1140560  0000 50ec 0000 0000 4400 0015 0000 5100 0001 6ad0 8000 0000 0000 0000 0001 6add 8000 0000 0000 0000 0000 0000 4400 0016
1140640  0000 5100 0000 0000 4400 0014 0000 5100 0001 6aeb 8000 0000 0000 0000 0001 6b0a 0400 0000 0000 5120 0001 6b12 0400 0000
1140720  0000 6b10 0001 6b3b 0400 0000 0000 6c1c 0001 6b52 0400 0000 0000 6c48 0001 6b69 0400 0000 0000 6aac 0001 6b89 0400 0000
1141000  0000 6ccc 0001 6b9e 0400 0000 0000 5120 0001 6baf 0400 0000 0000 6c70 0001 6bc7 0800 0000 0004 92a0 0001 6bd6 0400 0000
1141060  0000 6bbc 0001 6bf0 0400 0000 0000 6bec 0001 6c0a 0400 0000 0000 6b44 0001 6c21 0400 0000 0000 6c98 0001 6c38 0400 0000
1141140  0000 5284 0001 6c49 0400 0000 0000 6cfc 0001 6c64 6400 0000 0000 5120 0001 6c94 6400 0000 0000 5120 0001 6c9c 8400 0000
1141220  0000 5120 0001 6ca6 8000 0000 0000 0000 0001 6cd0 8000 0000 0000 0000 0001 6cea 8000 0000 0000 0000 0001 6d15 8000 0000
1141300  0000 0000 0001 6d37 8000 0000 0000 0000 0001 6d5a 8000 0000 0000 0000 0001 6d80 8000 0000 0000 0000 0001 6da2 8000 0000
1141360  0000 0000 0001 6dc3 8000 0000 0000 0000 0001 6ddc 8000 0000 0000 0000 0001 6df7 8000 0000 0000 0000 0001 6e0b 8000 0000
1141440  0000 0000 0001 6e1d 8000 0004 ffff fb05 0001 6e3b 8000 0008 ffff fb05 0001 6e78 8000 0001 ffff fb05 0001 6e95 8000 0004
1141520  ffff fb05 0001 6ea3 2000 0004 0000 0000 0001 6eb0 2000 0004 0000 0000 0001 6ec0 2000 0001 0000 0000 0001 6edf 2000 0004
1141600  0000 0000 0001 6eea 2000 0004 0000 0000 0001 6ef7 2000 0004 0000 0000 0001 6f04 2000 0001 0000 0000 0001 6f13 2000 0004
1141660  0000 0000 0001 6f21 2000 0004 0000 0000 0001 6f2f 8000 0004 ffff fb05 0001 6f40 8000 0004 ffff fb05 0001 6f4e 8000 0004
1141740  ffff fb05 0001 6f5f 8000 0004 ffff fb05 0001 6f70 8000 0004 ffff fb05 0001 6fe7 8000 0004 ffff fb05 0001 707f 8000 0004
1142020  ffff fb05 0001 70c3 8000 0004 ffff fb05 0001 7143 8000 0004 ffff fb05 0001 71bd 8000 0004 ffff fb05 0001 71eb 8000 003c
1142100  ffff fb05 0001 7302 8000 003c ffff fb05 0001 73fe 2000 0004 0000 0000 0001 7415 2000 0004 0000 0000 0001 742e 2000 0004
1142160  0000 0000 0001 7446 2000 0004 0000 0000 0001 745b 2000 0004 0000 0000 0001 7471 2000 0001 0000 0000 0001 748a 8000 0000
1142240  0000 0000 0001 7550 8000 0000 0000 0000 0001 7616 8000 0000 0000 0000 0001 76d6 8000 0000 0000 0000 0001 772a 8000 0028
1142320  ffff fb05 0001 7844 8000 0028 ffff fb05 0001 78a9 8000 0000 0000 0000 0001 7974 8000 0000 0000 0000 0001 7a3f 8000 0000
1142400  0000 0000 0001 7afd 8000 0000 0000 0000 0001 7bc1 8000 0000 0000 0000 0001 7c86 8000 0000 0000 0000 0001 7ce5 8000 0048
1142460  ffff fb05 0001 7d63 8000 0000 0000 0000 0001 7e27 8000 0000 0000 0000 0001 7ef1 8000 0000 0000 0000 0001 7fc6 8000 0000
1142540  0000 0000 0001 8092 8000 0000 0000 0000 0001 8130 8000 0044 ffff fb05 0001 8187 8000 0000 0000 0000 0001 824d 8000 0000
1142620  0000 0000 0001 8318 8000 0000 0000 0000 0001 83e5 8000 0000 0000 0000 0001 8427 2400 0044 0000 5120 0001 8447 a000 0044
1142700  0000 0044 0001 8457 a000 0001 0000 0048 0001 8463 8400 0000 0000 5120 0000 0000 4400 01d1 0000 5120 0001 8480 4000 0044
1142760  0000 0018 0000 0000 4400 01d1 0000 5130 0001 8490 8000 0000 0000 0000 0001 849d 8000 0000 0000 0000 0000 0000 4400 01d2
1143040  0000 5130 0000 0000 4400 01d3 0000 5164 0000 0000 4400 01d4 0000 5208 0000 0000 4400 01d6 0000 5238 0000 0000 4400 01d8
1143120  0000 5260 0000 0000 4400 01d9 0000 5274 0001 84a7 8000 0000 0000 0000 0001 84bc 8000 0050 ffff fb05 0001 8537 8000 0000
1143200  0000 0000 0001 85be 2000 0000 0000 0000 0001 85e0 2000 0000 0000 0000 0001 8603 2000 0000 0000 0000 0001 8610 2000 0000
1143260  0000 0000 0001 861d 8000 0001 ffff fb05 0001 8657 2000 0004 0000 0000 0001 8679 2000 0004 0000 0000 0001 869b 8000 0000
1143340  0000 0000 0001 8728 2800 0001 0004 92a0 0001 873e 8000 0004 ffff fb05 0001 874a 8000 0008 ffff fb05 0001 87ad 8000 0000
1143420  0000 0000 0001 8829 8000 0004 ffff fb05 0001 885e 8000 0000 0000 0000 0001 88b2 8000 0008 ffff fb05 0001 891d 8000 0000
1143500  0000 0000 0001 8983 8000 0004 ffff fb05 0001 89b8 8000 0000 0000 0000 0001 8a14 8000 0008 ffff fb05 0001 8a77 8000 0000
1143560  0000 0000 0001 8add 8000 0004 ffff fb05 0001 8b12 8000 0000 0000 0000 0001 8b6e 8000 0008 ffff fb05 0001 8bdc 8000 0000
1143640  0000 0000 0001 8c69 8000 0004 ffff fb05 0001 8ca0 8000 0000 0000 0000 0001 8d02 8000 0008 ffff fb05 0001 8d58 8000 0000
1143720  0000 0000 0001 8dd9 8000 0004 ffff fb05 0001 8e10 8000 0000 0000 0000 0001 8e68 8000 0008 ffff fb05 0001 8ebe 8000 0000
1144000  0000 0000 0001 8f28 8000 0004 ffff fb05 0001 8f5f 8000 0000 0000 0000 0001 8fbf 8000 0008 ffff fb05 0001 9015 8000 0000
1144060  0000 0000 0001 907f 8000 0004 ffff fb05 0001 90b6 8000 0000 0000 0000 0001 9116 8000 0008 ffff fb05 0001 916f 8000 0000
1144140  0000 0000 0001 9201 8000 0004 ffff fb05 0001 923a 8000 0000 0000 0000 0001 92a0 8000 0034 ffff fb05 0001 93b9 8000 0034
1144220  ffff fb05 0001 949b 8000 0000 0000 0000 0001 9565 8000 0000 0000 0000 0001 9592 8000 0040 ffff fb05 0001 96aa 8000 0040
1144300  ffff fb05 0001 97c4 2000 0004 0000 0000 0001 97de 8000 0000 0000 0000 0001 98ab 8000 0000 0000 0000 0001 9956 8000 0084
1144360  ffff fb05 0001 99db 8000 0000 0000 0000 0001 9ab0 8000 0000 0000 0000 0001 9b2c 8000 0004 ffff fb05 0001 9b40 8000 0004
1144440  ffff fb05 0001 9b6f 8000 0000 0000 0000 0001 9bf4 2000 0008 0000 0000 0001 9c17 8000 0008 ffff fb05 0001 9c22 8000 0008
1144520  ffff fb05 0001 9c2e 8000 0008 ffff fb05 0001 9c3a 8000 0008 ffff fb05 0001 9c86 8000 0000 0000 0000 0001 9d4c 8000 0000
1144600  0000 0000 0001 9dae 8000 0044 ffff fb05 0001 9e10 8000 0000 0000 0000 0001 9ed6 8000 0000 0000 0000 0001 9f01 8000 0008
1144660  ffff fb05 0001 9f0d 8000 000c ffff fb05 0001 9f80 8000 0000 0000 0000 0001 a00c 8000 0008 ffff fb05 0001 a060 8000 0000
1144740  0000 0000 0001 a0e0 8000 000c ffff fb05 0001 a156 8000 0000 0000 0000 0001 a201 2000 0008 0000 0000 0001 a226 8000 000c
1145020  ffff fb05 0001 a28a 8000 0000 0000 0000 0001 a34b 8000 0000 0000 0000 0001 a3bb 2000 0008 0000 0000 0001 a3dc 8000 000c
1145100  ffff fb05 0001 a441 8000 0000 0000 0000 0001 a50f 8000 0000 0000 0000 0001 a57d 2000 0008 0000 0000 0001 a59f 8000 0008
1145160  ffff fb05 0001 a600 8000 0000 0000 0000 0001 a6a7 8000 0004 ffff fb05 0001 a6e3 8000 0004 ffff fb05 0001 a724 8000 0004
1145240  ffff fb05 0001 a762 8000 0004 ffff fb05 0001 a79d 8000 0004 ffff fb05 0001 a7db 8000 0004 ffff fb05 0001 a7fd 8000 0004
1145320  ffff fb05 0001 a81f 2000 0001 0000 0000 0001 a82e 8000 0010 ffff fb05 0001 a8be 8000 0000 0000 0000 0001 a96f 8000 0018
```

```
1145400 ffff fb05 0001 a9ff 8000 0000 0000 0000 0001 aacf 8000 0000 0000 0000 0001 ab57 2000 0008 0000 0000 0001 ab7a 8000 0024
1145460 ffff fb05 0001 acc7 8000 0000 0000 0000 0001 ad87 8000 0000 0000 0000 0001 ae1b 8000 0004 ffff fb05 0001 ae64 8000 0000
1145540 0000 0000 0001 ae77 8000 0010 ffff fb05 0001 af00 8000 0000 0000 0000 0001 afc4 8000 0000 0000 0000 0001 b083 8000 0000
1145620 0000 0000 0001 b09a 2000 0008 0000 0000 0001 b0bf 8000 003c ffff fb05 0001 b1c7 8000 003c ffff fb05 0001 b252 8000 0000
1145700 0000 0000 0001 b315 8000 0000 0000 0000 0001 b3e7 8000 0000 0000 0000 0001 b4b2 8000 0000 0000 0000 0001 b58e 8000 0000
1145760 0000 0000 0001 b668 8000 0000 0000 0000 0001 b72f 8000 0000 0000 0000 0001 b77d 2000 0008 0000 0000 0001 b7a3 8000 001c
1146040 ffff fb05 0001 b847 8000 0000 0000 0000 0001 b91f 8000 0000 0000 0000 0001 b9f3 8000 0000 0000 0000 0001 bac9 8000 0000
1146120 0000 0000 0001 baec 2000 0008 0000 0000 0001 bb1a 8000 003c ffff fb05 0001 bc1b 8000 003c ffff fb05 0001 bc80 8000 0000
1146200 0000 0000 0001 bd46 8000 0000 0000 0000 0001 be03 8000 0000 0000 0000 0001 be96 2000 0008 0000 0000 0001 beb9 8000 0090
1146260 ffff fb05 0001 bfb4 8000 0090 ffff fb05 0001 c07a 8000 0000 0000 0000 0001 c147 8000 0000 0000 0000 0001 c213 8000 0000
1146340 0000 0000 0001 c2e3 8000 0000 0000 0000 0001 c37f 2000 0008 0000 0000 0001 c3a1 2400 003c 0000 5284 0001 c3c2 a000 003c
1146420 0000 0044 0001 c3d3 8400 0000 0000 5284 0000 0000 4400 0010 0000 5284 0001 c3e4 4000 003c 0000 0018 0000 0000 4400 0010
1146500 0000 5290 0001 c3f5 8000 0000 0000 0000 0000 0000 4400 000f 0000 5290 0000 0000 4400 0010 0000 5398 0000 0000 4400 0011
1146560 0000 539c 0000 0000 4400 0012 0000 53a0 0000 0000 4400 0010 0000 53a4 0000 0000 4400 0028 0000 53b8 0000 0000 4400 0029
1146640 0000 53c4 0001 c402 8000 0000 0000 0000 0001 c417 2000 0024 0000 0000 0001 c42c 2000 0001 0000 0000 0001 c439 8400 0000
1146720 0000 53d4 0001 c443 2400 0001 0000 53d4 0001 c464 a000 0090 0000 0044 0001 c47e a000 0001 0000 0048 0000 0000 4400 001b
1147000 0000 53d4 0001 c48b 4000 0090 0000 0018 0000 0000 4400 001b 0000 53e4 0001 c49c 8000 0000 0000 0000 0001 c4a9 8000 0000
1147060 0000 0000 0000 0000 4400 001c 0000 53e4 0000 0000 4400 001d 0000 5404 0000 0000 4400 001e 0000 5414 0000 0000 4400 001f
1147140 0000 5434 0000 0000 4400 0020 0000 5444 0000 0000 4400 0021 0000 5464 0000 0000 4400 0023 0000 5474 0000 0000 4400 0024
1147220 0000 5490 0000 0000 4400 0026 0000 5498 0001 c4b3 8000 0000 0000 0000 0001 c4d2 2400 0001 0000 54a8 0001 c4ec a000 0090
1147300 0000 0044 0001 c4fd a000 0001 0000 0048 0000 0000 4400 002c 0000 54a8 0001 c50a 4000 0090 0000 0018 0000 0000 4400 002c
1147360 0000 54b8 0001 c51b 8000 0000 0000 0000 0001 c528 8000 0000 0000 0000 0000 0000 4400 002d 0000 54b8 0000 0000 4400 002f
1147440 0000 5524 0000 0000 4400 0030 0000 553c 0000 0000 4400 0032 0000 5550 0000 0000 4400 0033 0000 5568 0000 0000 4400 0035
1147520 0000 557c 0000 0000 4400 0036 0000 5594 0000 0000 4400 0038 0000 55a8 0000 0000 4400 0039 0000 55c0 0000 0000 4400 003b
1147600 0000 55d4 0000 0000 4400 003c 0000 55ec 0000 0000 4400 003d 0000 5600 0000 0000 4400 003e 0000 5618 0001 c532 8000 0000
1147660 0000 0000 0001 c54a 2400 0001 0000 5628 0001 c564 a000 0090 0000 0044 0001 c575 a000 0001 0000 0048 0000 0000 4400 0041
1147740 0000 5628 0001 c581 4000 0090 0000 0018 0000 0000 4400 0041 0000 5638 0001 c592 8000 0000 0000 0000 0001 c59f 8000 0000
1150020 0000 0000 0000 0000 4400 0042 0000 5638 0000 0000 4400 0043 0000 564c 0000 0000 4400 0044 0000 5654 0000 0000 4400 0045
1150100 0000 5668 0000 0000 4400 0046 0000 567c 0000 0000 4400 0047 0000 5690 0000 0000 4400 0048 0000 569c 0001 c5a9 8000 0000
1150160 0000 0000 0001 c5c1 2400 0004 0000 56ac 0001 c5df a000 0090 0000 0044 0001 c5f0 a000 0004 0000 0048 0000 0000 4400 004d
1150240 0000 56ac 0001 c606 4000 0090 0000 0018 0000 0000 4400 004d 0000 56bc 0001 c617 8000 0000 0000 0000 0001 c624 8000 0000
1150320 0000 0000 0000 0000 4400 004e 0000 56bc 0001 c62e 8000 0000 0000 0000 0001 c64a 2400 0004 0000 56e8 0001 c668 a000 0090
1150400 0000 0044 0001 c679 a000 0004 0000 0048 0000 0000 4400 0055 0000 56e8 0001 c687 4000 0090 0000 0018 0000 0000 4400 0055
1150460 0000 56f8 0001 c698 8000 0000 0000 0000 0001 c6a5 8000 0000 0000 0000 0000 0000 4400 0056 0000 56f8 0001 c6af 8000 0000
1150540 0000 0000 0001 c6cb 2400 0004 0000 5724 0001 c6e8 a000 0090 0000 0044 0000 0000 4400 005c 0000 5724 0001 c6f9 4000 0090
1150620 0000 0018 0000 0000 4400 005c 0000 5730 0001 c70a 8000 001c ffff fffc 0000 0000 c000 0002 0000 0610 0001 c721 8000 0000
1150700 0000 0000 0000 0000 4400 005f 0000 5730 0001 c72e 8000 0000 0000 0000 0000 0000 4400 0060 0000 5730 0000 0000 4400 0062
1150760 0000 574c 0000 0000 4400 0063 0000 576c 0000 0000 4400 0064 0000 577c 0000 0000 4400 0065 0000 57a0 0000 0000 4400 0067
1151040 0000 57c0 0000 0000 4400 0068 0000 57e4 0000 0000 4400 006a 0000 580c 0000 0000 4400 006b 0000 5828 0000 0000 4400 006c
1151120 0000 5838 0000 0000 4400 006f 0000 5844 0000 0000 4400 0070 0000 5868 0000 0000 4400 0072 0000 5890 0000 0000 4400 0073
1151200 0000 58ac 0000 0000 4400 0074 0000 58bc 0000 0000 4400 0077 0000 58c8 0000 0000 4400 007a 0000 58d4 0000 0000 4400 007b
1151260 0000 58e4 0000 0000 e000 0002 0000 07d0 0000 0000 4400 007c 0000 58f0 0001 c73a 8000 0000 0000 0000 0001 c755 2400 0001
1151340 0000 5900 0001 c775 a000 0090 0000 0044 0000 0000 4400 0080 0000 5900 0001 c786 4000 0090 0000 0018 0000 0000 4400 0080
1151420 0000 590c 0001 c797 8000 003c ffff fffc 0001 c7a5 8000 0008 ffff fff8 0001 c7b2 8000 0008 ffff fff0 0001 c7c0 8000 0024
1151500 ffff ffec 0001 c7db 8000 0001 ffff ffe8 0000 0000 c000 0002 0000 07ec 0001 c7f2 8000 0000 0000 0000 0000 0000 4400 0087
1151560 0000 590c 0001 c7ff 8000 0000 0000 0000 0000 0000 4400 0088 0000 590c 0001 c80b 8000 0000 0000 0000 0000 0000 4400 0089
1151640 0000 590c 0001 c816 8000 0000 0000 0000 0000 0000 4400 008a 0000 590c 0001 c822 8000 0000 0000 0000 0000 0000 4400 008b
1151720 0000 590c 0001 c83a 8000 0000 0000 0000 0000 0000 4400 008c 0000 590c 0000 0000 4400 0085 0000 590c 0000 0000 4400 0087
1152000 0000 5920 0000 0000 4400 0088 0000 5974 0000 0000 4400 008a 0000 59a0 0000 0000 4400 008b 0000 59b4 0000 0000 4400 008c
1152060 0000 59c0 0000 0000 4400 008d 0000 5a04 0000 0000 4400 008e 0000 5a5c 0000 0000 4400 008f 0000 5a6c 0000 0000 4400 0091
1152140 0000 5aa0 0000 0000 4400 0092 0000 5acc 0000 0000 e000 0002 0000 09d8 0000 0000 4400 0093 0000 5af8 0001 c84f 8000 0000
1152220 0000 0000 0001 c86d 2400 0001 0000 5b08 0001 c88e a000 0090 0000 0044 0000 0000 4400 0098 0000 5b08 0001 c89f 4000 0090
1152300 0000 0018 0000 0000 4400 0098 0000 5b14 0001 c8b0 8000 003c ffff fffc 0001 c8be 8000 0008 ffff fff8 0001 c8cb 8000 0008
1152360 ffff fff0 0001 c8d9 8000 0024 ffff ffec 0001 c9f4 8000 0001 ffff ffe8 0000 0000 c000 0002 0000 09f4 0001 c90b 8000 0000
1152440 0000 0000 0000 0000 4400 009f 0000 5b14 0001 c918 8000 0000 0000 0000 0000 0000 4400 00a0 0000 5b14 0001 c924 8000 0000
```

```
1152520 0000 0000 0000 0000 4400 00a1 0000 5b14 0001 c92f 8000 0000 0000 0000 0000 0000 4400 00a2 0000 5b14 0001 c93b 8000 0000
1152600 0000 0000 0000 0000 4400 00a3 0000 5b14 0001 c953 8000 0000 0000 0000 0000 0000 4400 00a4 0000 5b14 0000 0000 4400 009d
1152660 0000 5b14 0000 0000 4400 009f 0000 5b28 0000 0000 4400 00a0 0000 5b7c 0000 0000 4400 00a1 0000 5bd0 0000 0000 4400 00a2
1152740 0000 5be4 0000 0000 4400 00a3 0000 5bf0 0000 0000 4400 00a4 0000 5c48 0000 0000 4400 00a5 0000 5c98 0000 0000 4400 00a6
1153020 0000 5cf0 0000 0000 4400 00a7 0000 5d00 0000 0000 4400 00a9 0000 5d34 0000 0000 e000 0002 0000 0c48 0000 0000 4400 00ab
1153100 0000 5d68 0001 c768 8000 0000 0000 0000 0001 c987 2400 0001 0000 5d78 0001 c9ac a000 0090 0000 0044 0001 c9bd a000 0001
1153160 0000 0048 0000 0000 4400 00b0 0000 5d78 0001 c9cd 4000 0090 0000 0018 0000 0000 4400 00b0 0000 5d88 0001 c9de 8000 0000
1153240 0000 0000 0001 c9eb 8000 0000 0000 0000 0000 0000 4400 00b1 0000 5d88 0000 0000 4400 00b4 0000 5d88 0000 0000 4400 00b5
1153320 0000 5dac 0000 0000 4400 00b6 0000 5db8 0001 c9f8 8000 0000 0000 0000 0001 ca1a 2400 0001 0000 5dc8 0001 ca40 a000 0090
1153400 0000 0044 0001 ca51 a000 0001 0000 0048 0000 0000 4400 00ba 0000 5dc8 0000 0000 4400 00ba 0000 5ddc 0001 ca61 8000 0000
1153460 0000 0000 0001 ca6e 8000 0000 0000 0000 0000 0000 4400 00bb 0000 5ddc 0000 0000 4400 00bc 0000 5ddc 0000 0000 4400 00bd
1153540 0000 5df8 0000 0000 4400 00be 0000 5e04 0001 ca7b 8000 0000 0000 0000 0001 ca9e 2400 0001 0000 5e14 0001 cabe a000 0090
1153620 0000 0044 0000 0000 4400 00c5 0000 5e14 0001 cacf 4000 0090 0000 0018 0000 0000 4400 00c5 0000 5e20 0001 cae0 8000 0000
1153700 0000 0000 0000 0000 4400 00c6 0000 5e20 0000 0000 4400 00c7 0000 5e30 0000 0000 4400 00c8 0000 5e40 0000 0000 4400 00c9
1153760 0000 5e50 0001 caed 8000 0000 0000 0000 0001 cb0b 2400 0001 0000 5e60 0001 cb31 a000 0090 0000 0044 0001 cb42 a000 000c
1154040 0000 0048 0000 0000 4400 00cd 0000 5e60 0001 cb5f 4000 0090 0000 0018 0000 0000 4400 00cd 0000 5e70 0001 cb70 8000 0008
1154120 ffff fffc 0001 cb7c 8000 003c ffff fff8 0001 cb88 8000 0008 ffff fff0 0000 0000 c000 0002 0000 0d50 0001 cb95 8000 0000
1154200 0000 0000 0000 0000 4400 00d1 0000 5e70 0001 cba2 8000 0000 0000 0000 0000 0000 4400 00d2 0000 5e70 0001 cbb3 8000 0000
1154260 0000 0000 0000 0000 4400 00d3 0000 5e70 0001 cbbd 8000 0000 0000 0000 0000 0000 4400 00d4 0000 5e70 0001 cbc7 8000 0000
1154340 0000 0000 0000 0000 4400 00d5 0000 5e70 0000 0000 4400 00d0 0000 5e70 0000 0000 4400 00d2 0000 5e88 0000 0000 4400 00d3
1154420 0000 5e9c 0000 0000 4400 00d4 0000 5ea8 0000 0000 4400 00d7 0000 5efc 0000 0000 4400 00d8 0000 5f14 0000 0000 4400 00da
1154500 0000 5f24 0000 0000 e000 0002 0000 0e64 0000 0000 4400 00dc 0000 5f84 0001 cbd2 8000 0000 0000 0000 0001 cbf6 2400 0004
1154560 0000 5f94 0001 cc17 a000 0090 0000 0044 0000 0000 4400 00e2 0000 5f94 0001 cc28 4000 0090 0000 0018 0000 0000 4400 00e2
1154640 0000 5fa0 0001 cc39 8000 001c ffff fffc 0001 cc48 8000 003c ffff fff8 0001 cc59 8000 0001 ffff fff4 0000 0000 c000 0002
1154720 0000 0e80 0001 cc6b 8000 0000 0000 0000 0000 0000 4400 00e6 0000 5fa0 0001 cc78 8000 0000 0000 0000 0000 0000 4400 00e7
1155000 0000 5fa0 0001 cc84 8000 0000 0000 0000 0000 0000 4400 00e8 0000 5fa0 0001 cc93 8000 0000 0000 0000 0000 0000 4400 00e9
1155060 0000 5fa0 0000 0000 4400 00e7 0000 5fa0 0000 0000 4400 00e8 0000 5fc4 0000 0000 4400 00e9 0000 5ff0 0000 0000 4400 00ea
1155140 0000 601c 0000 0000 4400 00eb 0000 6030 0000 0000 4400 00ef 0000 6054 0000 0000 4400 00f0 0000 607c 0000 0000 4400 00f3
1155220 0000 608c 0000 0000 e000 0002 0000 0f78 0000 0000 4400 00f4 0000 6098 0001 cca3 8000 0000 0000 0000 0001 ccc2 2400 0004
1155300 0000 60a8 0001 cce2 a000 0090 0000 0044 0000 0000 4400 00f8 0000 60a8 0001 ccf3 4000 0090 0000 0018 0000 0000 4400 00f8
1155360 0000 60b4 0001 cd04 8000 003c ffff fffc 0000 0000 c000 0002 0000 0f94 0001 cd1f 8000 0000 0000 0000 0000 0000 4400 00f9
1155440 0000 60b4 0001 cd2c 8000 0000 0000 0000 0000 0000 4400 00fa 0000 60b4 0000 0000 4400 00fb 0000 60c4 0000 0000 4400 00fe
1155520 0000 60f0 0000 0000 4400 0100 0000 6114 0000 0000 4400 0101 0000 6134 0000 0000 4400 0103 0000 6140 0000 0000 4400 0104
1155600 0000 6170 0000 0000 4400 0105 0000 61a0 0000 0000 e000 0002 0000 10ac 0000 0000 4400 0106 0000 61cc 0001 cd44 8000 0000
1155660 0000 0000 0001 cd62 2400 0001 0000 61dc 0001 cd84 a000 0090 0000 0044 0000 0000 4400 010b 0000 61dc 0001 cd95 4000 0090
1155740 0000 0018 0000 0000 4400 010b 0000 61e8 0001 cda6 8000 0024 ffff fffc 0001 cdc1 8000 0001 ffff fff8 0001 cdd8 8000 003c
1156020 ffff fff4 0000 0000 c000 0002 0000 10c8 0001 cdf3 8000 0000 0000 0000 0000 0000 4400 010c 0000 61e8 0001 ce00 8000 0000
1156100 0000 0000 0000 0000 4400 010d 0000 61e8 0001 ce18 8000 0000 0000 0000 0000 0000 4400 010e 0000 61e8 0001 ce2d 8000 0000
1156160 0000 0000 0000 0000 4400 010f 0000 61e8 0000 0000 4400 010d 0000 61e8 0000 0000 4400 010f 0000 61f8 0000 0000 4400 0110
1156240 0000 622c 0000 0000 4400 0112 0000 6260 0000 0000 4400 0113 0000 6278 0000 0000 4400 0114 0000 629c 0000 0000 4400 0116
1156320 0000 62d0 0000 0000 4400 0117 0000 630c 0000 0000 4400 0119 0000 6340 0000 0000 e000 0002 0000 124c 0000 0000 4400 011b
1156400 0000 636c 0001 ce45 8000 0000 0000 0000 0001 ce65 2400 0001 0000 637c 0001 ce85 a000 0090 0000 0044 0000 0000 4400 011f
1156460 0000 637c 0001 ce96 4000 0090 0000 0018 0000 0000 4400 011f 0000 6388 0001 cea7 8000 003c ffff fffc 0001 ceb5 8000 0008
1156540 ffff fff8 0001 cec2 8000 0008 ffff fff0 0001 ced0 8000 0024 ffff ffec 0001 ceeb 8000 0001 ffff ffe8 0000 0000 c000 0002
1156620 0000 1268 0001 cf02 8000 0000 0000 0000 0000 0000 4400 0125 0000 6388 0001 cf0f 8000 0000 0000 0000 0000 0000 4400 0126
1156700 0000 6388 0001 cf1b 8000 0000 0000 0000 0000 0000 4400 0127 0000 6388 0001 cf26 8000 0000 0000 0000 0000 0000 4400 0128
1156760 0000 6388 0001 cf32 8000 0000 0000 0000 0000 0000 4400 0129 0000 6388 0001 cf4a 8000 0000 0000 0000 0000 0000 4400 012a
1157040 0000 6388 0000 0000 4400 0123 0000 6398 0000 0000 4400 0125 0000 639c 0000 0000 4400 0126 0000 63c8 0000 0000 4400 0127
1157120 0000 641c 0000 0000 4400 0129 0000 6448 0000 0000 4400 012a 0000 645c 0000 0000 4400 012b 0000 6468 0000 0000 4400 012c
1157200 0000 64ac 0000 0000 4400 012d 0000 6504 0000 0000 4400 012e 0000 6514 0000 0000 4400 0130 0000 6548 0000 0000 4400 0131
1157260 0000 6574 0000 0000 e000 0002 0000 14a8 0000 0000 4400 0132 0000 65c8 0001 cf5f 8000 0000 0000 0000 0001 cf7d 2400 0001
1157340 0000 65d8 0001 cf9c a000 0090 0000 0044 0000 0000 4400 0136 0000 65d8 0001 cfad 4000 0090 0000 0018 0000 0000 4400 0136
1157420 0000 65e4 0001 cfbe 8000 003c ffff fffc 0001 cfcc 8000 0008 ffff fff8 0001 cfd9 8000 0008 ffff fff0 0001 cfe7 8000 0024
1157500 ffff ffec 0001 d002 8000 0001 ffff ffe8 0000 0000 c000 0002 0000 14c4 0001 d019 8000 0000 0000 0000 0000 0000 4400 013c
1157560 0000 65e4 0001 d026 8000 0000 0000 0000 0000 0000 4400 013d 0000 65e4 0001 d032 8000 0000 0000 0000 0000 0000 4400 013e
```

```
1157640  0000 65e4 0001 d03d 8000 0000 0000 0000 0000 0000 4400 013f 0000 65e4 0001 d049 8000 0000 0000 0000 0000 0000 4400 0140
1157720  0000 65e4 0001 d061 8000 0000 0000 0000 0000 0000 4400 0141 0000 65e4 0000 0000 4400 013a 0000 65e4 0000 0000 4400 013d
1160000  0000 65f8 0000 0000 4400 0141 0000 664c 0000 0000 4400 0142 0000 66a0 0000 0000 4400 0143 0000 66cc 0000 0000 4400 0144
1160060  0000 66e0 0000 0000 4400 0145 0000 66ec 0000 0000 4400 0146 0000 6734 0000 0000 4400 0147 0000 678c 0000 0000 4400 0148
1160140  0000 679c 0000 0000 4400 014a 0000 67d0 0000 0000 4400 014e 0000 67fc 0000 0000 4400 014f 0000 6828 0000 0000 4400 0150
1160220  0000 687c 0000 0000 4400 0154 0000 68a8 0000 0000 4400 0155 0000 68d0 0000 0000 4400 0156 0000 68e4 0000 0000 4400 0157
1160300  0000 68f0 0000 0000 4400 0158 0000 6938 0000 0000 4400 0159 0000 6990 0000 0000 4400 015a 0000 69a0 0000 0000 4400 015d
1160360  0000 69d4 0000 0000 4400 015e 0000 6a00 0000 0000 e000 0002 0000 190c 0000 0000 4400 015f 0000 6a2c 0001 d076 8000 0000
1160440  0000 0000 0001 d093 2400 0001 0000 6a3c 0001 d0b1 8400 0000 0000 6a3c 0000 0000 4400 023b 0000 6a3c 0000 0000 4400 023b
1160520  0000 6a48 0001 d0ce 8400 0000 0000 6a58 0000 0000 4400 0015 0000 6a58 0000 0000 4400 0016 0000 6a6c 0001 d0d8 2400 0001
1160600  0000 6a7c 0001 d0f6 8400 0000 0000 6a7c 0000 0000 4400 023b 0000 6a7c 0000 0000 4400 023b 0000 6a88 0000 0000 4400 023c
1160660  0000 6a9c 0001 d113 2000 0008 0000 0000 0001 d13f 2000 0008 0000 0000 0001 d16e 2000 0008 0000 0000 0001 d1a7 2400 0001
1160740  0000 6aac 0001 d1cd a000 001c 0000 0044 0001 d1de a000 0001 0000 0048 0001 d1eb 8400 0000 0000 6aac 0000 0000 4400 001c
1161020  0000 6aac 0001 d1ff 4000 001c 0000 0018 0000 0000 4400 001c 0000 6abc 0001 d210 8000 0000 0000 0000 0001 d21d 8000 0000
1161100  0000 0000 0000 0000 4400 001d 0000 6abc 0000 0000 4400 001c 0000 6abc 0000 0000 4400 001d 0000 6b00 0001 d227 8000 0000
1161160  0000 0000 0001 d24b 2400 0001 0000 6b10 0001 d27a a000 003c 0000 0044 0001 d28a a000 0001 0000 0048 0001 d297 8400 0000
1161240  0000 6b10 0000 0000 4400 002e 0000 6b10 0001 d2ab 4000 003c 0000 0018 0000 0000 4400 002e 0000 6b20 0001 d2bb 8000 0000
1161320  0000 0000 0001 d2c8 8000 0000 0000 0000 0000 0000 4400 002f 0000 6b20 0000 0000 4400 002d 0000 6b20 0001 d2d2 8000 0000
1161400  0000 0000 0001 d2ff 2400 0001 0000 6b44 0001 d31c a000 000c 0000 0044 0001 d335 a000 0001 0000 0048 0001 d342 8400 0000
1161460  0000 6b44 0000 0000 4400 0012 0000 6b44 0001 d376 4000 000c 0000 0018 0000 0000 4400 0012 0000 6b54 0001 d387 8000 0000
1161540  0000 0000 0001 d394 8000 0000 0000 0000 0000 0000 4400 0013 0000 6b54 0000 0000 4400 0011 0000 6b54 0000 0000 4400 0012
1161620  0000 6b78 0000 0000 4400 0013 0000 6bac 0001 d39e 8000 0000 0000 0000 0001 d3b9 2400 0004 0000 6bbc 0001 d3d9 a000 0008
1161700  0000 0044 0001 d3e9 a000 0004 0000 0048 0001 d3fb 8400 0000 0000 6bbc 0000 0000 4400 001b 0000 6bbc 0000 0000 4400 001b
1161760  0000 6bd0 0001 d42e 8000 0000 0000 0000 0001 d43b 8000 0000 0000 0000 0000 0000 4400 001c 0000 6bd0 0000 0000 4400 001a
1162040  0000 6bd0 0001 d449 8000 0000 0000 0000 0001 d467 2400 0004 0000 6bec 0001 d487 a000 0008 0000 0044 0001 d497 a000 0004
1162120  0000 0048 0000 0000 4400 001a 0000 6c00 0001 d4a9 8000 0000 0000 0000 0001 d4b6 8000 0000 0000 0000 0000 0000 4400 001b
1162200  0000 6c00 0000 0000 4400 0019 0000 6c00 0001 d4c4 8000 0000 0000 0000 0001 d4e2 2400 0001 0000 6c1c 0001 d4ff a000 0008
1162260  0000 0044 0001 d50f a000 0001 0000 0048 0001 d520 a000 0008 0000 004c 0000 0000 4400 0019 0000 6c38 0001 d531 8000 0000
1162340  0000 0000 0001 d53e 8000 0000 0000 0000 0000 0000 4400 001a 0000 6c38 0001 d54c 8000 0000 0000 0000 0000 0000 4400 001b
1162420  0000 6c38 0000 0000 4400 0018 0000 6c38 0001 d55a 8000 0000 0000 0000 0001 d575 2400 0001 0000 6c48 0001 d592 a000 0008
1162500  0000 0044 0001 d5a2 a000 0001 0000 0048 0001 d5b3 a000 0004 0000 004c 0000 0000 4400 0018 0000 6c60 0001 d5c3 8000 0000
1162560  0000 0000 0001 d5d0 8000 0000 0000 0000 0000 0000 4400 0019 0000 6c60 0001 d5de 8000 0000 0000 0000 0000 0000 4400 001a
1162640  0000 6c60 0000 0000 4400 0017 0000 6c60 0001 d5ec 8000 0000 0000 0000 0001 d607 2400 0001 0000 6c70 0001 d625 a000 0008
1162720  0000 0044 0001 d635 a000 0001 0000 0048 0001 d646 a000 0001 0000 004c 0000 0000 4400 0017 0000 6c88 0001 d657 8000 0000
1163000  0000 0000 0001 d664 8000 0000 0000 0000 0000 0000 4400 0018 0000 6c88 0001 d672 8000 0000 0000 0000 0000 0000 4400 0019
1163060  0000 6c88 0000 0000 4400 0016 0000 6c88 0001 d680 8000 0000 0000 0000 0001 d69c 2400 0001 0000 6c98 0001 d6ba a000 0008
1163140  0000 0044 0001 d6ca a000 0001 0000 0048 0001 d6db a000 0004 0000 004c 0000 0000 4400 0016 0000 6cb0 0001 d6eb 8000 0000
1163220  0000 0000 0001 d6f8 8000 0000 0000 0000 0000 0000 4400 0017 0000 6cb0 0001 d706 8000 0000 0000 0000 0000 0000 4400 0018
1163300  0000 6cb0 0000 0000 4400 0015 0000 6cb0 0001 d714 8000 0000 0000 0000 0001 d72f 2400 0001 0000 6ccc 0001 d74b a000 0008
1163360  0000 0044 0001 d75b a000 0004 0000 0048 0000 0000 4400 0015 0000 6ce0 0001 d76b 8000 0000 0000 0050 0001 d778 8000 0000
1163440  0000 0000 0000 0000 4400 0016 0000 6ce0 0000 0000 4400 0014 0000 6ce0 0001 d786 8000 0000 0000 0000 0001 d79f 2400 0004
1163520  0000 6cfc 0001 d7c0 a000 0004 0000 0044 0001 d7d1 a000 0004 0000 0048 0001 d7e3 8400 0000 0000 6cfc 0000 0000 4400 0015
1163600  0000 6cfc 0000 0000 4400 0015 0000 6d10 0001 d815 8000 0000 0000 0000 0001 d822 8000 0000 0000 0000 0000 0000 4400 0016
1163660  0000 6d10 0000 0000 4400 0014 0000 6d10 0001 d830 8000 0000 0000 0000 0001 d84f 0400 0000 0000 6d30 0001 d859 0400 0000
1163740  0000 78fc 0001 d870 0400 0000 0000 7928 0001 d887 0400 0000 0000 79ac 0001 d89c 0400 0000 0000 6130 0001 d8ad 0400 0000
1164020  0000 7950 0001 d8c5 0400 0000 0000 7774 0001 d8df 0800 0000 0004 92a8 0001 d8ee 0400 0000 0000 7884 0001 d905 0400 0000
1164100  0000 7978 0001 d91c 0400 0000 0000 6e74 0001 d92d 0400 0000 0000 79dc 0001 d948 6400 0000 0000 6130 0001 d978 6400 0000
1164160  0000 6d30 0001 d982 8400 0000 0000 6d30 0001 d98e 8000 0000 0000 0000 0001 d9b8 8000 0000 0000 0000 0001 d9d2 8000 0000
1164240  0000 0000 0001 d9fd 8000 0000 0000 0000 0001 da1f 8000 0000 0000 0000 0001 da42 8000 0000 0000 0000 0001 da68 8000 0000
1164320  0000 0000 0001 da8a 8000 0000 0000 0000 0001 daab 8000 0000 0000 0000 0001 dac4 8000 0000 0000 0000 0001 dadf 8000 0000
1164400  0000 0000 0001 daf3 8000 0000 0000 0000 0001 db05 8000 0004 ffff fb05 0001 db23 8000 0008 ffff fb05 0001 db60 8000 0001
1164460  ffff fb05 0001 db7d 8000 0004 ffff fb05 0001 db8b 8000 0004 ffff fb05 0001 db9c 8000 0004 ffff fb05 0001 dbad 8000 0004
1164540  ffff fb05 0001 dc24 8000 0004 ffff fb05 0001 dcbc 8000 0004 ffff fb05 0001 dd00 8000 0004 ffff fb05 0001 dd80 8000 0004
1164620  ffff fb05 0001 ddfa 8000 0004 ffff fb05 0001 de28 8000 003c ffff fb05 0001 df3f 8000 003c ffff fb05 0001 e03b 2000 0004
1164700  0000 0000 0001 e052 2000 0004 0000 0000 0001 e06b 2000 0004 0000 0000 0001 e083 2000 0004 0000 0000 0001 e098 2000 0004
```

```
1164760  0000 0000 0001 e0ae 2000 0001 0000 0000 0001 e0c7 8000 0000 0000 0000 0001 e18d 8000 0000 0000 0000 0001 e253 8000 0000
1165040  0000 0000 0001 e313 8000 0000 0000 0000 0001 e367 8000 0028 ffff fb05 0001 e488 8000 0028 ffff fb05 0001 e4ed 8000 0000
1165120  0000 0000 0001 e5b8 8000 0000 0000 0000 0001 e683 8000 0000 0000 0000 0001 e741 8000 0000 0000 0000 0001 e805 8000 0000
1165200  0000 0000 0001 e8ca 8000 0000 0000 0000 0001 e929 8000 0048 ffff fb05 0001 e9a7 8000 0000 0000 0000 0001 ea6b 8000 0000
1165260  0000 0000 0001 eb35 8000 0000 0000 0000 0001 ec0a 8000 0000 0000 0000 0001 ecd6 8000 0000 0000 0000 0001 ed74 8000 0044
1165340  ffff fb05 0001 e1cb 8000 0000 0000 0000 0001 ee91 8000 0000 0000 0000 0001 ef5c 8000 0000 0000 0000 0001 f029 8000 0000
1165420  0000 0000 0001 f06b 2400 0044 0000 6d30 0001 f08b a000 0044 0000 0044 0001 f09b a000 0001 0000 0048 0001 f0a7 8400 0000
1165500  0000 6d30 0000 0000 4400 01d1 0000 6d30 0001 f0c4 4000 0044 0000 0018 0000 0000 4400 01d1 0000 6d40 0001 f0d4 8000 0000
1165560  0000 0000 0001 f0e1 8000 0000 0000 0000 0000 0000 4400 01d2 0000 6d40 0000 0000 4400 01d3 0000 6d74 0000 0000 4400 01d4
1165640  0000 6e18 0000 0000 4400 01d6 0000 6e48 0000 0000 4400 01d8 0000 6e78 0000 0000 4400 01d9 0000 6e84 0001 f0eb 8000 0000
1165720  0000 0000 0001 f100 8000 0050 ffff fb05 0001 f17b 8000 0000 0000 0000 0001 f202 2000 0000 0000 0000 0001 f224 2000 0000
1166000  0000 0000 0001 f247 2000 0000 0000 0000 0001 f254 2000 0000 0000 0000 0001 f261 8000 0001 ffff fb05 0001 f29b 2000 0004
1166060  0000 0000 0001 f2bd 2000 0004 0000 0000 0001 f2df 8000 0000 0000 0000 0001 f36c 2800 0001 0004 92a8 0001 f382 8000 0004
1166140  ffff fb05 0001 f38e 8000 0008 ffff fb05 0001 f3f1 8000 0000 0000 0000 0001 f46d 8000 0004 ffff fb05 0001 f4a2 8000 0000
1166220  0000 0000 0001 f4f6 8000 0008 ffff fb05 0001 f561 8000 0000 0000 0000 0001 f5c7 8000 0004 ffff fb05 0001 f5fc 8000 0000
1166300  0000 0000 0001 f658 8000 0008 ffff fb05 0001 f6bb 8000 0000 0000 0000 0001 f721 8000 0004 ffff fb05 0001 f756 8000 0000
1166360  0000 0000 0001 f7b2 8000 0008 ffff fb05 0001 f820 8000 0000 0000 0000 0001 f8ad 8000 0004 ffff fb05 0001 f8e4 8000 0000
1166440  0000 0000 0001 f946 8000 0008 ffff fb05 0001 f99c 8000 0000 0000 0000 0001 fa1d 8000 0004 ffff fb05 0001 fa54 8000 0000
1166520  0000 0000 0001 faac 8000 0008 ffff fb05 0001 fb02 8000 0000 0000 0000 0001 fb6c 8000 0004 ffff fb05 0001 fba3 8000 0000
1166600  0000 0000 0001 fc03 8000 0008 ffff fb05 0001 fc59 8000 0000 0000 0000 0001 fcc3 8000 0004 ffff fb05 0001 fcfa 8000 0000
1166660  0000 0000 0001 fd5a 8000 0008 ffff fb05 0001 f1b3 8000 0000 0000 0000 0001 fe45 8000 0004 ffff fb05 0001 fe7e 8000 0000
1166740  0000 0000 0001 fee4 2000 0004 0000 0000 0001 fef1 2000 0004 0000 0000 0001 ff01 8000 0034 ffff fb05 0002 001a 8000 0034
1167020  ffff fb05 0002 00fc 8000 0000 0000 0000 0002 01c6 8000 0000 0000 0000 0002 01f3 8000 0040 ffff fb05 0002 030b 8000 0040
1167100  ffff fb05 0002 0425 2000 0004 0000 0000 0002 043f 8000 0000 0000 0000 0002 050c 8000 0000 0000 0000 0002 05b7 8000 0084
1167160  ffff fb05 0002 063c 8000 0000 0000 0000 0002 0711 8000 0000 0000 0000 0002 078d 8000 0004 ffff fb05 0002 07a1 8000 0004
1167240  ffff fb05 0002 07d0 8000 0000 0000 0000 0002 0855 2000 0008 0000 0000 0002 087a 8000 0008 ffff fb05 0002 0885 8000 0008
1167320  ffff fb05 0002 0891 8000 0008 ffff fb05 0002 089d 8000 0008 ffff fb05 0002 08e9 8000 0000 0000 0000 0002 09af 8000 0000
1167400  0000 0000 0002 0a11 9000 0044 ffff fb05 0002 0a73 8000 0000 0000 0000 0002 0b39 8000 0000 0000 0000 0002 0b64 8000 0008
1167460  ffff fb05 0002 0b70 8000 000c ffff fb05 0002 0be3 8000 0000 0000 0000 0002 0c6f 8000 0008 ffff fb05 0002 0cc3 8000 0000
1167540  0000 0000 0002 0d43 8000 000c ffff fb05 0002 0db9 8000 0000 0000 0000 0002 0e64 2000 0008 0000 0000 0002 0e8b 8000 000c
1167620  ffff fb05 0002 0eef 8000 0000 0000 0000 0002 0fb0 8000 0000 0000 0000 0002 1020 2000 0008 0000 0000 0002 1043 8000 000c
1167700  ffff fb05 0002 10a8 9000 0000 0000 0000 0002 1176 8000 0000 0000 0000 0002 11e4 2000 0008 0000 0000 0002 1208 8000 0008
1167760  ffff fb05 0002 1269 8000 0000 0000 0000 0002 1319 8000 0004 ffff fb05 0002 134c 8000 0004 ffff fb05 0002 138d 8000 0004
1170040  ffff fb05 0002 13cb 8000 0004 ffff fb05 0002 1406 8000 0004 ffff fb05 0002 1444 8000 0004 ffff fb05 0002 1466 8000 0004
1170120  ffff fb05 0002 1488 2000 0001 0000 0000 0002 1497 8000 0010 ffff fb05 0002 1527 8000 0000 0000 0000 0002 15d8 8000 0018
1170200  ffff fb05 0002 1668 8000 0000 0000 0000 0002 1738 8000 0000 0000 0000 0002 17c0 2000 0008 0000 0000 0002 17e5 8000 0024
1170260  ffff fb05 0002 1932 8000 0000 0000 0000 0002 19f2 8000 0000 0000 0000 0002 1a86 8000 003c ffff fb05 0002 1b87 8000 003c
1170340  ffff fb05 0002 1bec 8000 0000 0000 0000 0002 1cb2 8000 0000 0000 0000 0002 1d6f 8000 0000 0000 0000 0002 1e02 2000 0008
1170420  0000 0000 0002 1e27 8000 0090 ffff fb05 0002 1f21 8000 0090 ffff fb05 0002 1fe6 8000 0000 0000 0000 0002 20b3 8000 0000
1170500  0000 0000 0002 217f 9000 0000 0000 0000 0002 224f 8000 0000 0000 0000 0002 22eb 2000 0008 0000 0000 0002 230f 2400 003c
1170560  0000 6e94 0002 232f a000 003c 0000 0044 0002 233f 8400 0000 0000 6e94 0000 0000 4400 0010 0000 6e94 0002 2350 4000 003c
1170640  0000 0018 0000 0000 4400 0010 0000 6ea0 0002 2360 8000 0000 0000 0000 0000 0000 4400 000f 0000 6ea0 0000 0000 4400 0010
1170720  0000 6fa8 0000 0000 4400 0011 0000 6fac 0000 0000 4400 0012 0000 6fb0 0000 0000 4400 0010 0000 6fb4 0000 0000 4400 0028
1171000  0000 6fc8 0000 0000 4400 0029 0000 6fd4 0002 2363 8000 0000 0000 0000 0002 2382 8000 0034 ffff fb05 0002 24d3 8000 0000
1171060  0000 0000 0002 2594 8000 0000 0000 0000 0002 2655 8000 0000 0000 0000 0002 270d 2000 0008 0000 0000 0002 2737 2000 0024
1171140  0000 0000 0002 274b 8400 0000 0000 6fe4 0002 2757 2400 0034 0000 6fe4 0002 2783 a000 0034 0000 0044 0002 2793 a000 003c
1171220  0000 0048 0000 0000 4400 0011 0000 6fe4 0002 27a0 4000 0034 0000 0018 0000 0000 4400 0011 0000 6ff4 0002 27b0 8000 0001
1171300  ffff fffc 0002 27c7 8000 0001 ffff fff8 0002 27de 8000 0001 ffff fff4 0002 27f5 8000 0004 ffff fff0 0002 280b 8000 0004
1171360  ffff ffec 0000 0000 c000 0002 0000 02c4 0002 2821 8000 0000 0000 0000 0000 0000 4400 0012 0000 6ff4 0002 282e 8000 0000
1171440  0000 0000 0000 0000 4400 0013 0000 6ff4 0002 2838 8000 0000 0000 0000 0000 0000 4400 0014 0000 6ff4 0002 284d 8000 0000
1171520  0000 0000 0000 0000 4400 0015 0000 6ff4 0002 2862 8000 0000 0000 0000 0000 0000 4400 0016 0000 6ff4 0002 2877 8000 0000
1171600  0000 0000 0000 0000 4400 0017 0000 6ff4 0002 288c 8000 0000 0000 0000 0000 0000 4400 0018 0000 6ff4 0000 0000 4400 0011
1171660  0000 6ff4 0000 0000 4400 0012 0000 70fc 0000 0000 4400 0013 0000 7128 0000 0000 4400 0014 0000 7144 0000 0000 4400 0015
1171740  0000 7160 0000 0000 4400 0016 0000 7174 0000 0000 4400 0017 0000 7188 0000 0000 4400 0018 0000 7198 0000 0000 e000 0002
1172020  0000 0474 0000 0000 4400 0019 0000 71a4 0002 28a1 8000 0000 0000 0000 0002 28c2 2400 0004 0000 71b4 0002 28e6 a000 0034
```

```
1172100 0000 0044 0002 29f6 a000 003c 0000 0048 0000 0000 4400 001c 0000 71b4 0002 2903 4000 0034 0000 0018 0000 0000 4400 001c
1172160 0000 71c4 0002 2913 8000 0000 0000 0000 0002 2920 8000 0000 0000 0000 0000 0000 4400 001d 0000 71c4 0000 0000 4400 001e
1172240 0000 71c4 0000 0000 4400 0022 0000 723c 0000 0000 4400 0024 0000 7248 0000 0000 4400 0025 0000 7254 0002 292a 8000 0000
1172320 0000 0000 0002 294c 2400 0004 0000 7264 0002 2970 a000 0034 0000 0044 0002 2980 a000 0004 0000 0048 0000 0000 4400 0029
1172400 0000 7264 0000 0000 4400 0029 0000 7278 0002 2996 8000 0034 ffff fffc 0000 0000 c000 0002 0000 0548 0002 29a3 8000 0000
1172460 0000 0000 0000 0000 4400 002d 0000 7278 0002 29b0 8000 0000 0000 0000 0000 0000 4400 002e 0000 7278 0002 29ba 8000 0000
1172540 0000 0000 0000 0000 4400 002f 0000 7278 0000 0000 4400 002a 0000 7278 0000 0000 4400 002c 0000 7294 0000 0000 4400 002e
1172620 0000 729c 0000 0000 4400 002f 0000 72b8 0000 0000 4400 0031 0000 72c4 0000 0000 e000 0002 0000 05a0 0000 0000 4400 0032
1172700 0000 72d0 0002 2?c5 8000 0000 0000 0000 0002 29e7 2400 0004 0000 72e0 0002 2a0b a000 0034 0000 0044 0002 2a1b a000 0004
1172760 0000 0048 0000 0000 4400 0038 0000 72e0 0000 0000 4400 0038 0000 72f4 0002 2a29 8000 0034 ffff fffc 0000 0000 c000 0002
1173040 0000 05c4 0002 2a36 8000 0000 0000 0000 0000 0000 4400 003b 0000 72f4 0002 2a43 8000 0000 0000 0000 0000 0000 4400 003c
1173120 0000 72f4 0002 2a4d 8000 0000 0000 0000 0000 0000 4400 003d 0000 72f4 0000 0000 4400 0039 0000 72f4 0000 0000 4400 003a
1173200 0000 7310 0000 0000 4400 003c 0000 7318 0000 0000 4400 003d 0000 7334 0000 0000 4400 003f 0000 7340 0000 0000 e000 0002
1173260 0000 061c 0000 0000 4400 0040 0000 734c 0002 2a58 8000 0000 0000 0000 0002 2a7a 2400 0001 0000 735c 0002 2aa0 a000 0034
1173340 0000 0044 0000 0000 4400 0046 0000 735c 0002 2ab0 4000 0034 0000 0018 0000 0000 4400 0046 0000 7368 0002 2ac0 8000 0001
1173420 ffff fe00 0002 2ae4 8000 0001 ffff fdfc 0002 2af7 8000 0008 ffff fdf8 0002 2b03 8000 0090 ffff fdf4 0002 2b18 8000 0008
1173500 ffff fdec 0002 2b25 8000 0024 ffff fde8 0002 2b3f 8000 003c ffff fde4 0000 0000 c000 0002 0000 0638 0002 2b59 8000 0000
1173560 0000 0000 0000 0000 4400 0051 0000 7368 0002 2b66 8000 0000 0000 0000 0000 0000 4400 0052 0000 7368 0002 2b73 8000 0000
1173640 0000 0000 0000 0000 4400 0053 0000 7368 0002 2b84 8000 0000 0000 0000 0000 0000 4400 0054 0000 7368 0002 2b8e 8000 0000
1173720 0000 0000 0000 0000 4400 0055 0000 7368 0002 2b98 8000 0000 0000 0000 0000 0000 4400 0056 0000 7368 0002 2ba3 8000 0000
1174000 0000 0000 0000 0000 4400 0057 0000 7368 0002 2bbb 8000 0000 0000 0000 0000 0000 4400 0058 0000 7368 0000 0000 4400 004c
1174060 0000 7368 0000 0000 4400 004f 0000 7370 0000 0000 4400 0051 0000 7384 0000 0000 4400 0053 0000 7398 0000 0000 4400 0054
1174140 0000 73ac 0000 0000 4400 0055 0000 73c8 0000 0000 4400 0056 0000 73f4 0000 0000 4400 0058 0000 7420 0000 0000 4400 0059
1174220 0000 7434 0000 0000 4400 005a 0000 7440 0000 0000 4400 005b 0000 746c 0000 0000 4400 005c 0000 7478 0000 0000 4400 005f
1174300 0000 74d8 0000 0000 4400 0061 0000 7500 0000 0000 4400 0062 0000 7528 0000 0000 4400 0063 0000 753c 0000 0000 4400 0064
1174360 0000 7548 0000 0000 4400 0065 0000 755c 0000 0000 4400 0066 0000 7574 0000 0000 4400 0067 0000 7598 0000 0000 4400 0068
1174440 0000 75b4 0000 0000 4400 0069 0000 75e0 0000 0000 4400 006a 0000 75ec 0000 0000 4400 006b 0000 7614 0000 0000 4400 006c
1174520 0000 7620 0000 0000 4400 006d 0000 762c 0000 0000 4400 006f 0000 7638 0000 0000 e000 0002 0000 0968 0000 0000 4400 0071
1174600 0000 7698 0002 2bd3 8000 0000 0000 0000 0002 2bf7 2400 0001 0000 76a8 0002 2c16 8400 0000 0000 76a8 0000 0000 4400 023b
1174660 0000 76a8 0000 0000 4400 023b 0000 76b4 0000 0000 4400 023c 0000 76c4 0002 2c33 2400 0001 0000 76d4 0000 0000 4400 023b
1174740 0000 76d4 0000 0000 4400 023b 0000 76e0 0000 0000 4400 023c 0000 76f4 0002 2c52 2000 0008 0000 0000 0002 2c84 2000 0008
1175020 0000 0000 0002 2cbf 2400 0001 0000 7704 0002 2cdf a000 0034 0000 0044 0002 2cef a000 0001 0000 0048 0002 2cfc 8400 0000
1175100 0000 7704 0000 0000 4400 0026 0000 7704 0002 2d0e 4000 0034 0000 0018 0000 0000 4400 0026 0000 7714 0002 2d1e 8000 0000
1175160 0000 0000 0002 2d2b 8000 0000 0000 0000 0000 0000 4400 0027 0000 7714 0000 0000 4400 0026 0000 7714 0000 0000 4400 0027
1175240 0000 7760 0000 0000 4400 0028 0000 7794 0000 0000 4400 0029 0000 77c8 0000 0000 4400 002a 0000 77fc 0000 0000 4400 002b
1175320 0000 7810 0000 0000 4400 002c 0000 7834 0000 0000 4400 002d 0000 784c 0000 0000 4400 002e 0000 7860 0000 0000 4400 002f
1175400 0000 7874 0002 2d35 8000 0000 0000 0000 0002 2d53 2400 0001 0000 7884 0002 2d70 a000 000c 0000 0044 0002 2d89 a000 0001
1175460 0000 0048 0002 2d96 8400 0000 0000 7884 0000 0000 4400 0012 0000 7884 0002 2dca 4000 000c 0000 0018 0000 0000 4400 0012
1175540 0000 7894 0002 2ddb 8000 0000 0000 0000 0002 2de8 8000 0000 0000 0000 0000 0000 4400 0013 0000 7894 0000 0000 4400 0011
1175620 0000 7894 0000 0000 4400 0012 0000 78b8 0000 0000 4400 0013 0000 78ec 0002 2df2 8000 0000 0000 0000 0002 2e0d 2400 0001
1175700 0000 78fc 0002 2e2a a000 0008 0000 0044 0002 2e3a a000 0001 0000 0048 0002 2e4b a000 0008 0000 004c 0002 2e5c 8400 0000
1175760 0000 78fc 0000 0000 4400 0019 0000 78fc 0000 0000 4400 0019 0000 7918 0002 2e8f 8000 0000 0000 0000 0002 2e9c 8000 0000
1176040 0000 0000 0000 0000 4400 001a 0000 7918 0002 2eaa 8000 0000 0000 0000 0000 0000 4400 001b 0000 7918 0000 0000 4400 0018
1176120 0000 7918 0002 2eb8 8000 0000 0000 0000 0002 2ed3 2400 0001 0000 7928 0002 2ef0 a000 0008 0000 0044 0002 2f00 a000 0001
1176200 0000 0048 0002 2f11 a000 0004 0000 004c 0000 0000 4400 0018 0000 7940 0002 2f21 8000 0000 0000 0000 0002 2f2e 8000 0000
1176260 0000 0000 0000 0000 4400 0019 0000 7940 0002 2f3c 8000 0000 0000 0000 0000 0000 4400 001a 0000 7940 0000 0000 4400 0017
1176340 0000 7940 0002 2f4a 8000 0000 0000 0000 0002 2f65 2400 0001 0000 7950 0002 2f83 a000 0008 0000 0044 0002 2f93 a000 0001
1176420 0000 0048 0002 2fa4 a000 0001 0000 004c 0000 0000 4400 0017 0000 7968 0002 2fb5 8000 0000 0000 0000 0002 2fc2 8000 0000
1176500 0000 0000 0000 0000 4400 0018 0000 7968 0002 2fd0 8000 0000 0000 0000 0000 0000 4400 0019 0000 7968 0000 0000 4400 0016
1176560 0000 7968 0002 2fde 8000 0000 0000 0000 0002 2ffa 2400 0001 0000 7978 0002 3018 a000 0008 0000 0044 0002 3028 a000 0001
1176640 0000 0048 0002 3039 a000 0004 0000 004c 0000 0000 4400 0016 0000 7990 0002 3049 8000 0000 0000 0000 0002 3056 8000 0000
1176720 0000 0000 0000 0000 4400 0017 0000 7990 0002 3064 8000 0000 0000 0000 0000 0000 4400 0018 0000 7990 0000 0000 4400 0015
1177000 0000 7990 0002 3072 8000 0000 0000 0000 0002 308d 2400 0001 0000 79ac 0002 30a9 a000 0008 0000 0044 0002 30b9 a000 0004
1177060 0000 0048 0000 0000 4400 0015 0000 79c0 0002 30c9 8000 0000 0000 0000 0002 30d6 8000 0000 0000 0000 0000 0000 4400 0016
1177140 0000 79c0 0000 0000 4400 0014 0000 79c0 0002 30e4 8000 0000 0000 0000 0002 30fd 2400 0004 0000 79dc 0002 311e a000 0004
```

```
1177220  0000 0044 0002 312f a000 0004 0000 0048 0002 3141 8400 0000 0000 79dc 0000 0000 4400 0015 0000 79dc 0000 0000 4400 0015
1177300  0000 79f0 0002 3173 8000 0000 0000 0000 0002 3180 8000 0000 0000 0000 0000 0000 4400 0016 0000 79f0 0000 0000 4400 0014
1177360  0000 79f0 0002 319e 8000 0000 0000 0000 0002 31ad 0400 0000 0000 7a10 0002 31b6 0400 0000 0000 80b0 0002 31cd 0400 0000
1177440  0000 80dc 0002 31e4 0400 0000 0000 8160 0002 31f9 0400 0000 0000 7d5c 0002 320f 0400 0000 0000 7f98 0002 322e 0400 0000
1177520  0000 7a10 0002 323f 0400 0000 0000 8104 0002 3257 c800 0000 0004 92b0 0002 3266 0400 0000 0000 8050 0002 3280 0400 0000
1177600  0000 8080 0002 329a 0400 0000 0000 7f18 0002 32b1 0400 0000 0000 812c 0002 32c8 0400 0000 0000 7b74 0002 32d9 0400 0000
1177660  0000 8190 0002 32f4 6400 0000 0000 7a10 0002 3324 6400 0000 0000 7a10 0002 332d 8400 0000 0000 7a10 0002 3338 8000 0000
1177740  0000 0000 0002 3362 8000 0000 0000 0000 0002 337c 8000 0000 0000 0000 0002 33a7 8000 0000 0000 0000 0002 33c9 8000 0000
1200020  0000 0000 0002 33ec 8000 0000 0000 0000 0002 3412 8000 0000 0000 0000 0002 3434 8000 0000 0000 0000 0002 3455 8000 0000
1200100  0000 0000 0002 346e 8000 0000 0000 0000 0002 3489 8000 0000 0000 0000 0002 349d 8000 0000 0000 0000 0002 34af 8000 0004
1200160  ffff fb05 0002 34cd 8000 0008 ffff fb05 0002 350a 8000 0001 ffff fb05 0002 3527 8000 0004 ffff fb05 0002 3535 8000 0004
1200240  ffff fb05 0002 3546 8000 0004 ffff fb05 0002 3557 8000 0004 ffff fb05 0002 35ce 8000 0004 ffff fb05 0002 3666 8000 0004
1200320  ffff fb05 0002 36aa 8000 0004 ffff fb05 0002 372a 8000 0004 ffff fb05 0002 37a4 8000 0004 ffff fb05 0002 37d2 8000 003c
1200400  ffff fb05 0002 38e9 8000 003c ffff fb05 0002 39e5 2000 0004 0000 0000 0002 39fc 2000 0004 0000 0000 0002 3a15 2000 0004
1200460  0000 0000 0002 3a2d 2000 0004 0000 0000 0002 3a42 2000 0004 0000 0000 0002 3a58 2000 0001 0000 0000 0002 3a71 8000 0000
1200540  0000 0000 0002 3b37 8000 0000 0000 0000 0002 3bfd 8000 0000 0000 0000 0002 3cbd 8000 0000 0000 0000 0002 3d11 8000 0028
1200620  ffff fb05 0002 3e32 8000 0028 ffff fb05 0002 3e97 8000 0000 0000 0000 0002 3f62 8000 0000 0000 0000 0002 402d 8000 0000
1200700  0000 0000 0002 40eb 8000 0000 0000 0000 0002 41af 8000 0000 0000 0000 0002 4274 8000 0000 0000 0000 0002 42d3 8000 0048
1200760  ffff fb05 0002 4351 8000 0000 0000 0000 0002 4415 8000 0000 0000 0000 0002 44df 8000 0000 0000 0000 0002 45b4 8000 0000
1201040  0000 0000 0002 4680 8000 0000 0000 0000 0002 471e 8000 0044 ffff fb05 0002 4775 8000 0000 0000 0000 0002 483b 8000 0000
1201120  0000 0000 0002 4906 8000 0000 0000 0000 0002 49d3 8000 0000 0000 0000 0002 4a15 2400 0044 0000 7a10 0002 4a35 a000 0044
1201200  0000 0044 0002 4a45 a000 0001 0000 0048 0002 4a51 8400 0000 0000 7a10 0000 0000 4400 01d1 0000 7a10 0002 4a6e 4000 0044
1201260  0000 0018 0000 0000 4400 01d1 0000 7a20 0002 4a7e 8000 0000 0000 0000 0002 4a8b 8000 0000 0000 0000 0000 0000 4400 01d2
1201340  0000 7a20 0000 0000 4400 01d3 0000 7a54 0000 0000 4400 01d4 0000 7af8 0000 0000 4400 01d6 0000 7b28 0000 0000 4400 01d8
1201420  0000 7b58 0000 0000 4400 01d9 0000 7b64 0002 4a95 8000 0000 0000 0000 0002 4aaa 8000 0050 ffff fb05 0002 4b25 8000 0000
1201500  0000 0000 0002 4bac 2000 0000 0000 0000 0002 4bce 2000 0000 0000 0000 0002 4bf1 2000 0000 0000 0000 0002 4bfe 2000 0000
1201560  0000 0000 0002 4c0b 8000 0001 ffff fb05 0002 4c45 2000 0004 0000 0000 0002 4c67 2000 0004 0000 0000 0002 4c89 8000 0000
1201640  0000 0000 0002 4d16 2800 0001 0004 92b0 0002 4d2c 8000 0004 ffff fb05 0002 4d38 8000 0008 ffff fb05 0002 4d9b 8000 0000
1201720  0000 0000 0002 4e17 8000 0004 ffff fb05 0002 4e4c 8000 0000 0000 0000 0002 4ea0 8000 0008 ffff fb05 0002 4f0b 8000 0000
1202000  0000 0000 0002 4f71 8000 0004 ffff fb05 0002 4fa6 8000 0000 0000 0000 0002 5002 8000 0008 ffff fb05 0002 5065 8000 0000
1202060  0000 0000 0002 50cb 8000 0004 ffff fb05 0002 5109 8000 0000 0000 0000 0002 515c 8000 0008 ffff fb05 0002 51ca 8000 0000
1202140  0000 0000 0002 5257 8000 0004 ffff fb05 0002 528e 8000 0000 0000 0000 0002 52f0 8000 0008 ffff fb05 0002 5346 8000 0000
1202220  0000 0000 0002 53c7 8000 0004 ffff fb05 0002 53fe 8000 0000 0000 0000 0002 5456 8000 0008 ffff fb05 0002 54ac 8000 0000
1202300  0000 0000 0002 5516 8000 0004 ffff fb05 0002 554d 8000 0000 0000 0000 0002 55ad 8000 0008 ffff fb05 0002 5603 8000 0000
1202360  0000 0000 0002 566d 8000 0004 ffff fb05 0002 56a4 8000 0000 0000 0000 0002 5704 8000 0008 ffff fb05 0002 575d 8000 0000
1202440  0000 0000 0002 57ef 8000 0004 ffff fb05 0002 5828 8000 0000 0000 0000 0002 588e 2000 0004 0000 0000 0002 589b 2000 0004
1202520  0000 0000 0002 58ab 8000 0034 ffff fb05 0002 59c4 8000 0034 ffff fb05 0002 5aa6 8000 0000 0000 0000 0002 5b70 8000 0000
1202600  0000 0000 0002 5b9d 8000 0040 ffff fb05 0002 5cb5 8000 0040 ffff fb05 0002 5dcf 2000 0004 0000 0000 0002 5de9 8000 0000
1202660  0000 0000 0002 5eb6 8000 0000 0000 0000 0002 5f61 8000 0084 ffff fb05 0002 5fe6 8000 0000 0000 0000 0002 60bb 8000 0000
1202740  0000 0000 0002 6137 8000 0004 ffff fb05 0002 614b 8000 0004 ffff fb05 0002 617a 8000 0000 0000 0000 0002 61ff 2000 0008
1203020  0000 0000 0002 6223 8000 0008 ffff fb05 0002 622e 8000 0008 ffff fb05 0002 623a 8000 0008 ffff fb05 0002 6246 8000 0008
1203100  ffff fb05 0002 6292 8000 0000 0000 0000 0002 6358 8000 0000 0000 0000 0002 63ba 8000 0044 ffff fb05 0002 641c 8000 0000
1203160  0000 0000 0002 64e2 8000 0000 0000 0000 0002 650d 8000 0008 ffff fb05 0002 6519 8000 000c ffff fb05 0002 658c 8000 0000
1203240  0000 0000 0002 6618 8000 0008 ffff fb05 0002 666c 8000 0000 0000 0000 0002 66ec 8000 000c ffff fb05 0002 6762 8000 0000
1203320  0000 0000 0002 680d 2000 0008 0000 0000 0002 6833 8000 000c ffff fb05 0002 6897 8000 0000 0000 0000 0002 6958 8000 0000
1203400  0000 0000 0002 69c8 2000 0008 0000 0000 0002 69ea 8000 000c ffff fb05 0002 6a4f 8000 0000 0000 0000 0002 6b1d 8000 0000
1203460  0000 0000 0002 6b8b 2000 0008 0000 0000 0002 6bae 8000 0008 ffff fb05 0002 6c0f 8000 0000 0000 0000 0002 6cb6 8000 0004
1203540  ffff fb05 0002 6cf2 8000 0004 ffff fb05 0002 6d33 8000 0004 ffff fb05 0002 6d71 8000 0004 ffff fb05 0002 6dac 8000 0004
1203620  ffff fb05 0002 6 1ea 8000 0004 ffff fb05 0002 6e0c 8000 0004 ffff fb05 0002 6e2e 2000 0001 0000 0000 0002 6e3d 8000 0008
1203700  ffff fb05 0002 6e89 8000 0000 0000 0000 0002 6f46 8000 0000 0000 0000 0002 6f83 2000 0008 0000 0000 0002 6fa7 8000 0024
1203760  ffff fb05 0002 70f4 8000 0000 0000 0000 0002 71b4 8000 0000 0000 0000 0002 7248 8000 003c ffff fb05 0002 7349 8000 003c
1204040  ffff fb05 0002 73ae 8000 0000 0000 0000 0002 7474 8000 0000 0000 0000 0002 7531 8000 0000 0000 0000 0002 75c4 2000 0008
1204120  0000 0000 0002 75e8 8000 008c ffff fb05 0002 76e2 8000 008c ffff fb05 0002 7787 8000 0000 0000 0000 0002 7854 8000 0000
1204200  0000 0000 0002 7920 8000 0000 0000 0000 0002 79e2 8000 0000 0000 0000 0002 7a4b 2000 0008 0000 0000 0002 7a6e 2400 003c
1204260  0000 7b74 0002 7a8e a000 003c 0000 0044 0002 7a9e 8400 0000 0000 7b74 0000 0000 4400 0010 0000 7b74 0002 7aaf 4000 003c
```

```
1204340 0000 0018 0000 0000 4400 0010 0000 7b80 0002 7abf 8000 0000 0000 0000 0000 0000 4400 000f 0000 7b80 0000 0000 4400 0010
1204420 0000 7c38 0000 0000 4400 0011 0000 7c8c 0000 0000 4400 0012 0000 7c90 0000 0000 4400 0010 0000 7c94 0000 0000 4400 0028
1204500 0000 7ca8 0000 0000 4400 0029 0000 7cb4 0002 7acc 8000 0000 0000 0000 0002 7ae1 8000 0034 ffff fb05 0002 7c32 8000 0000
1204560 0000 0000 0002 7cf3 8000 0000 0000 0000 0002 7db4 8000 0000 0000 0000 0002 7e6c 2000 0008 0000 0000 0002 7e95 8000 0018
1204640 ffff fb05 0002 7f27 8000 0000 0000 0000 0002 7fef 8000 0000 0000 0000 0002 8025 2000 0008 0000 0000 0002 804b 2000 0024
1204720 0000 0000 0002 805f 2400 0001 0000 7cc4 0002 807c a000 0018 0000 0044 0002 8094 a000 0001 0000 0048 0002 80a1 8400 0000
1205000 0000 7cc4 0000 0000 4400 0014 0000 7cc4 0002 80ac 4000 0018 0000 0018 0000 0000 4400 0014 0000 7cd4 0002 80bc 8000 0000
1205060 0000 0000 0002 80c9 8000 0000 0000 0000 0000 0000 4400 0015 0000 7cd4 0000 0000 4400 0016 0000 7d20 0000 0000 4400 0017
1205140 0000 7d38 0000 0000 4400 0018 0000 7d4c 0002 80d3 8000 0000 0000 0000 0002 80ee 2400 0001 0000 7d5c 0002 810a a000 0024
1205220 0000 0044 0002 811a a000 0004 0000 0048 0002 812b 8400 0000 0000 7d5c 0000 0000 4400 0010 0000 7d5c 0002 813b 4000 0024
1205300 0000 0018 0000 0000 4400 0010 0000 7d6c 0002 814b 8000 0000 0000 0000 0002 8158 8000 0000 0000 0000 0000 0000 4400 0011
1205360 0000 7d6c 0000 0000 4400 000f 0000 7d6c 0000 0000 4400 0010 0000 7d84 0000 0000 4400 0011 0000 7d90 0000 0000 4400 0012
1205440 0000 7d9c 0000 0000 4400 0014 0000 7da8 0000 0000 4400 001e 0000 7dd0 0002 8167 8000 0000 0000 0000 0002 8181 2400 0001
1205520 0000 7de0 0002 81a4 a000 0018 0000 0044 0002 81b4 8400 0000 0000 7de0 0002 81bf 4000 0018 0000 0018 0000 0000 4400 001e
1205600 0000 7dec 0002 81cf 8000 0008 ffff fffc 0002 81db 8000 0034 ffff fff8 0002 81f0 8000 0008 ffff fff0 0002 81fd 8000 0024
1205660 ffff ffec 0000 0000 c000 0002 0000 03dc 0002 8217 8000 00c0 0000 0000 0000 0000 4400 0026 0000 7dec 0002 8224 8000 0000
1205740 0000 0000 0000 0000 4400 0027 0000 7dec 0002 822e 8000 0000 0000 0000 0000 0000 4400 0028 0000 7dec 0002 8238 8000 0000
1206020 0000 0000 0000 0000 4400 0029 0000 7dec 0002 8243 8000 0000 0000 0000 0000 0000 4400 002a 0000 7dec 0000 0000 4400 0024
1206100 0000 7dec 0000 0000 4400 0026 0000 7e00 0000 0000 4400 0028 0000 7e18 0000 0000 4400 0029 0000 7e34 0000 0000 4400 002b
1206160 0000 7e3c 0000 0000 4400 002c 0000 7e68 0000 0000 4400 002d 0000 7e7c 0000 0000 4400 002e 0000 7e90 0000 0000 4400 002f
1206240 0000 7e9c 0000 0000 4400 0030 0000 7ea8 0000 0000 4400 0033 0000 7f08 0000 0000 4400 0034 0000 7f18 0000 0000 e000 0002
1206320 0000 051c 0000 0000 4400 0035 0000 7f2c 0002 825b 8000 0000 0000 0000 0002 827c 2400 0001 0000 7f3c 0002 829e 8400 0000
1206400 0000 7f3c 0000 0000 4400 023b 0000 7f3c 0000 0000 4400 023b 0000 7f48 0000 0000 4400 023c 0000 7f58 0002 82bb 2400 0001
1206460 0000 7f68 0000 0000 4400 023b 0000 7f68 0000 0000 4400 023b 0000 7f74 0000 0000 4400 023c 0000 7f88 0002 82dd 2000 0008
1206540 0000 0000 0002 830c 2000 0008 0000 0000 0002 8346 2400 0001 0000 7f98 0002 836b a000 0018 0000 0044 0002 837b a000 0001
1206620 0000 0048 0002 8388 8400 0000 0000 7f98 0000 0000 4400 0009 0000 7f98 0002 8399 4000 0018 0000 0018 0000 0000 4400 0009
1206700 0000 7fa8 0002 83a7 8000 0000 0000 0000 0002 83b6 8000 0000 0000 0000 0000 0000 4400 000a 0000 7fa8 0000 0000 4400 0008
1206760 0000 7fa8 0000 0000 4400 0009 0000 7fb8 0000 0000 4400 000a 0000 7fc8 0002 83c0 8000 0000 0000 0000 0002 83e3 2400 0001
1207040 0000 7fd8 0002 8400 a000 000c 0000 0044 0002 8419 a000 0001 0000 0048 0002 8426 8400 0000 0000 7fd8 0000 0000 4400 0012
1207120 0000 7fd8 0002 845a 4000 000c 0000 0018 0000 0000 4400 0012 0000 7fe8 0002 846b 8000 0000 0000 0000 0002 8478 8000 0000
1207200 0000 0000 0000 0000 4400 0013 0000 7fe8 0000 0000 4400 0011 0000 7fe8 0000 0000 4400 0012 0000 800c 0000 0000 4400 0013
1207260 0000 8040 0002 8482 8000 0000 0000 0000 0002 849d 2400 0004 0000 8050 0002 84bd a000 0008 0000 0044 0002 84cd a000 0004
1207340 0000 0048 0002 84e7 8400 0000 0000 8050 0000 0000 4400 001b 0000 8050 0000 0000 4400 001b 0000 8064 0002 851a 8000 0000
1207420 0000 0000 0002 8527 8000 0000 0000 0000 0000 0000 4400 001c 0000 8064 0000 0000 4400 001a 0000 8064 0002 8535 8000 0000
1207500 0000 0000 0002 8553 2400 0004 0000 8080 0002 8573 a000 0008 0000 0044 0002 8583 a000 0004 0000 0048 0000 0000 4400 001a
1207560 0000 8094 0002 8595 8000 0000 0000 0000 0002 85a2 8000 0000 0000 0000 0000 0000 4400 001b 0000 8094 0000 0000 4400 0019
1207640 0000 8094 0002 85b0 8000 0000 0000 0000 0002 85ce 2400 0001 0000 80b0 0002 85eb a000 0008 0000 0044 0002 85fb a000 0001
1207720 0000 0048 0002 860c a000 0008 0000 004c 0000 0000 4400 0019 0000 80cc 0002 861d 8000 0000 0000 0000 0002 862a 8000 0000
1210000 0000 0000 0000 0000 4400 001a 0000 80cc 0002 8638 8000 0000 0000 0000 0000 0000 4400 001b 0000 80cc 0000 0000 4400 0018
1210060 0000 80cc 0002 8646 8000 0000 0000 0000 0002 8661 2400 0001 0000 80dc 0002 867e a000 0008 0000 0044 0002 868e a000 0001
1210140 0000 0048 0002 869f a000 0004 0000 004c 0000 0000 4400 0018 0000 80f4 0002 86af 8000 0000 0000 0000 0002 86bc 8000 0000
1210220 0000 0000 0000 0000 4400 0019 0000 80f4 0002 86ca 8000 0000 0000 0000 0000 0000 4400 001a 0000 80f4 0000 0000 4400 0017
1210300 0000 80f4 0002 86d8 8000 0000 0000 0000 0002 86f3 2400 0001 0000 8104 0002 8711 a000 0008 0000 0044 0002 8721 a000 0001
1210360 0000 0048 0002 8732 a000 0001 0000 004c 0000 0000 4400 0017 0000 811c 0002 8743 8000 0000 0000 0000 0002 8750 8000 0000
1210440 0000 0000 0000 0000 4400 0019 0000 811c 0002 875e 8000 0000 0000 0000 0000 0000 4400 0019 0000 811c 0000 0000 4400 0016
1210520 0000 811c 0002 876c 8000 0000 0000 0000 0002 8788 2400 0001 0000 812c 0002 87a6 a000 0008 0000 0044 0002 87b6 a000 0001
1210600 0000 0048 0002 87c7 a000 0004 0000 004c 0000 0000 4400 0016 0000 8144 0002 87d7 8000 0000 0000 0000 0002 87e4 8000 0000
1210660 0000 0000 0000 0000 4400 0017 0000 8144 0002 87f2 8000 0000 0000 0000 0000 0000 4400 0018 0000 8144 0000 0000 4400 0015
1210740 0000 8144 0002 8800 8000 0000 0000 0000 0002 881b 2400 0001 0000 8160 0002 8837 a000 0008 0000 0044 0002 8847 a000 0004
1211020 0000 0048 0000 0000 4400 0015 0000 8174 0002 8857 8000 0000 0000 0000 0002 8864 8000 0000 0000 0000 0000 0000 4400 0016
1211100 0000 8174 0000 0000 4400 0014 0000 8174 0002 8872 8000 0000 0000 0000 0002 888b 2400 0004 0000 8190 0002 88ac a000 0004
1211160 0000 0044 0002 88bd a000 0004 0000 0048 0002 88cf 8400 0000 0000 8190 0000 0000 4400 0015 0000 8190 0000 0000 4400 0015
1211240 0000 81a4 0002 8901 8000 0000 0000 0000 0002 890e 8000 0000 0000 0000 0000 0000 4400 0016 0000 81a4 0000 0000 4400 0014
1211320 0000 81a4 0002 891c 8000 0000 0000 0000 0002 893b 0400 0000 0000 81c0 0002 8947 0400 0000 0000 9058 0002 895e 0400 0000
1211400 0000 9084 0002 8975 0400 0000 0000 9108 0002 898a 0400 0000 0000 8f40 0002 89a9 0400 0000 0000 81c0 0002 89ba 0400 0000
```

```
1211460 0000 90ac 0002 89d2 0800 0000 0004 92b8 0002 89e1 0400 0000 0000 8ff8 0002 89fb 0400 0000 0000 9028 0002 8a15 0400 0000
1211540 0000 8f80 0002 8a2c 0400 0000 000c 88e8 0002 8a40 0400 0000 0000 90d4 0002 8a57 0400 0000 0000 8324 0002 8a68 0400 0000
1211620 0000 9138 0002 8a83 6400 0000 0000 81c0 0002 8ab3 6400 0000 0000 81c0 0002 8abf 8400 0000 0000 81c0 0002 8acd 8000 0000
1211700 0000 0000 0002 8af7 8000 0000 0000 0000 0002 8b11 8000 0000 0000 0000 0002 8b3c 8000 0000 0000 0000 0002 8b5e 8000 0000
1211760 0000 0000 0002 8b81 8000 0000 0000 0000 0002 8ba7 8000 0000 0000 0000 0002 8bc9 8000 0000 0000 0000 0002 8bea 8000 0000
1212040 0000 0000 0002 8c03 8000 0000 0000 0000 0002 8c1e 8000 0000 0000 0000 0002 8c32 8000 0000 0000 0000 0002 8c44 0000 0004
1212120 ffff fb05 0002 8c62 8000 0008 ffff fb05 0002 8c9f 8000 0001 ffff fb05 0002 8cbc 8000 0004 ffff fb05 0002 8cca 2000 0004
1212200 0000 0000 0002 8cd7 2000 0004 0000 0000 0002 8ce7 2000 0001 0000 0000 0002 8d06 2000 0004 0000 0000 0002 8d11 2000 0004
1212260 0000 0000 0002 8d1e 2000 0004 0000 0000 0002 812b 2000 0001 0000 0000 0002 8d3a 2000 0004 0000 0000 0002 8d48 2000 0004
1212340 0000 0000 0002 8d56 8000 0004 ffff fb05 0002 8d67 8000 0004 ffff fb05 0002 8d75 8000 0004 ffff fb05 0002 8d86 8000 0004
1212420 ffff fb05 0002 8d97 8000 0004 ffff fb05 0002 8e0e 8000 0004 ffff fb05 0002 8ea6 8000 0004 ffff fb05 0002 8eea 8000 0004
1212500 ffff fb05 0002 8f6a 8000 0004 ffff fb05 0002 8fe4 8000 0004 ffff fb05 0002 9012 8000 003c ffff fb05 0002 9129 8000 003c
1212560 ffff fb05 0002 9225 2000 0004 0000 0000 0002 923c 2000 0004 0000 0000 0002 9255 2000 0004 0000 0000 0002 926d 2000 0004
1212640 0000 0000 0002 9282 2000 0004 0000 0000 0002 9298 2000 0001 0000 0000 0002 92b1 8000 0000 0000 0000 0002 9377 8000 0000
1212720 0000 0000 0002 943d 8000 0000 0000 0000 0002 94fd 8000 0000 0000 0000 0002 9551 8000 0028 ffff fb05 0002 966b 8000 0028
1213000 ffff fb05 0002 95d0 8000 0000 0000 0000 0002 979b 8000 0000 0000 0000 0002 9866 8000 0000 0000 0000 0002 9924 8000 0000
1213060 0000 0000 0002 99e8 8000 0000 0000 0000 0002 9aad 8000 0000 0000 0000 0002 9b0c 8000 0048 ffff fb05 0002 9b8a 8000 0000
1213140 0000 0000 0002 9c4e 8000 0000 0000 0000 0002 9d18 8000 0000 0000 0000 0002 9ded 8000 0000 0000 0000 0002 9eb9 8000 0000
1213220 0000 0000 0002 9f57 8000 0044 ffff fb05 0002 9fae 8000 0000 0000 0000 0002 a074 8000 0000 0000 0000 0002 a13f 8000 0000
1213300 0000 0000 0002 a20c 8000 0000 0000 0000 0002 a24e 2400 0044 0000 81c0 0002 a26e a000 0044 0000 0044 0002 a27e a000 0001
1213360 0000 0048 0002 a28a d400 0000 0000 81c0 0000 0000 4400 01d1 0000 81c0 0002 a2a7 4000 0044 000c 0318 0000 0000 44c0 01d1
1213440 0000 81d0 0002 a2b7 8000 0000 0000 0000 0002 a2c4 8000 0000 0000 0000 0000 0000 4400 01d2 0000 81d0 0000 0000 4400 01d3
1213520 0000 8204 0000 0000 4400 01d4 0000 82a8 0000 0000 4400 01d6 0000 82d8 0000 0000 4400 01d8 0000 8308 0000 0000 4400 01d9
1213600 0000 8314 0002 a2ce 8000 0000 0000 0000 0002 a2e3 8000 0050 ffff fb05 0002 a35e 8000 0000 0000 0000 0002 a3e5 2000 0000
1213660 0000 0000 0002 a407 2000 0000 0000 0000 0002 a42a 2000 0000 0000 0000 0002 a437 2000 0000 0000 0000 0002 a444 8000 0001
1213740 ffff fb05 0002 a47e 2000 0004 0000 0000 0002 a4a0 2000 0004 0000 0000 0002 a4c2 8000 0000 0000 0000 0002 a54f 2800 0001
1214020 00c4 92b8 0002 a565 8000 0004 ffff fb05 0002 a571 8000 0008 ffff fb05 0002 a5d4 8000 0000 0000 0000 0002 a650 8000 0004
1214100 ffff fb05 0002 a685 8000 0000 0000 0000 0002 a6d9 8000 0008 ffff fb05 0002 a744 8000 0000 0000 0000 0002 a7aa 8000 0004
1214160 ffff fb05 0002 a7df 8000 0000 0000 0000 0002 a83b 8000 0008 ffff fb05 0002 a89e 8000 0000 0000 0000 0002 a904 8000 0004
1214240 ffff fb05 0002 a939 8000 0000 0000 0000 0002 a995 8000 0008 ffff fb05 0002 aa03 8000 0000 0000 0000 0002 aa90 8000 0004
1214320 ffff fb05 0002 aac7 8000 0000 0000 0000 0002 ab29 8000 0008 ffff fb05 0002 ab7f 8000 0000 0000 0000 0002 ac00 8000 0004
1214400 ffff fb05 0002 ac37 8000 0000 0000 0000 0002 ac8f 8000 0008 ffff fb05 0002 ace5 8000 0000 0000 0000 0002 ad4f 8000 0004
1214460 ffff fb05 0002 a186 8000 0000 0000 0000 0002 a1e6 8000 0008 ffff fb05 0002 ae3c 8000 0000 0000 0000 0002 aea6 8000 0004
1214540 ffff fb05 0002 aedd 8000 0000 0000 0000 0002 af3d 8000 0008 ffff fb05 0002 af96 8000 0000 0000 0000 0002 b028 8000 0004
1214620 ffff fb05 0002 b061 8000 0000 0000 0000 0002 b0c7 8000 0034 ffff fb05 0002 b1e0 8000 0034 ffff fb05 0002 b2c2 8000 0000
1214700 0000 0000 0002 b18c 8000 0000 0000 0000 0002 b3b9 8000 0040 ffff fb05 0002 b4d1 8000 0040 ffff fb05 0002 b5eb 2000 0004
1214760 0000 0000 0002 b605 8000 0000 0000 0000 0002 b6d2 8000 0000 0000 0000 0002 b77d 8000 0d84 ffff fb05 0002 b802 8000 0000
1215040 0000 0000 0002 b847 8000 0000 0000 0000 0002 b953 8000 0004 ffff fb05 0002 b967 8000 0004 ffff fb05 0002 b996 8000 0000
1215120 0000 0000 0002 ba1b 2000 0008 0000 0000 0002 ba42 8000 0008 ffff fb05 0002 ba4d 8000 0008 ffff fb05 0002 ba59 8000 0008
1215200 ffff fb05 0002 ba65 8000 0008 ffff fb05 0002 bab1 8000 0000 0000 0000 0002 bb77 8000 0000 0000 0000 0002 bbd9 8000 0044
1215260 ffff fb05 0002 bc3b 8000 0000 0000 0000 0002 bd01 8000 0000 0000 0000 0002 bd2c 8000 0008 ffff fb05 0002 bd38 8000 000c
1215340 ffff fb05 0002 bdab 8000 0000 0000 0000 0002 be37 8000 0008 ffff fb05 0002 be8b 8000 0000 0000 0000 0002 bf0b 8000 000c
1215420 ffff fb05 0002 bf81 8000 0000 0000 0000 0002 c02c 2000 0008 0000 0000 0002 c055 8000 000c ffff fb05 0002 c0b9 8000 0000
1215500 0000 0000 0002 c17a 8000 0000 0000 0000 0002 c1ea 2000 0008 0000 0000 0002 c20f 8000 000c ffff fb05 0002 c274 8000 0000
1215560 0000 0000 0002 c142 8000 0000 0000 0000 0002 c3b0 2000 0008 0000 0000 0002 c3d6 8000 0008 ffff fb05 0002 c437 8000 0000
1215640 0000 0000 0002 c4de 8000 0004 ffff fb05 0002 c51a 8000 0004 ffff fb05 0002 c55b 8000 0004 ffff fb05 0002 c599 8000 0004
1215720 ffff fb05 0002 c5d4 8000 0004 ffff fb05 0002 c612 8000 0004 ffff fb05 0002 c634 8000 0004 ffff fb05 0002 c656 2000 0001
1216000 0000 0000 0002 c665 8000 0008 ffff fb05 0002 c6b1 8000 0000 0000 0000 0002 c76e 8000 0000 0000 0000 0002 c7ab 2000 0008
1216060 0000 0000 0002 c7d2 8000 003c ffff fb05 0002 c8d3 8000 003c ffff fb05 0002 c938 8000 0000 0000 0000 0002 c9fe 8000 0000
1216140 0000 0000 0002 cabb 8000 0000 0000 0000 0002 cb4e 2000 0008 0000 0000 0002 cb75 8000 008c ffff fb05 0002 cc6f 8000 008c
1216220 ffff fb05 0002 cd14 8000 0000 0000 0000 0002 cde1 8000 0000 0000 0000 0002 cead 8000 0000 0000 0000 0002 cf6f 8000 0000
1216300 0000 0000 0002 cfd8 2000 0008 0000 0000 0002 cffe 2400 003c 0000 8324 0002 d01e a000 003c 0000 0044 0002 d02e 8400 0000
1216360 0000 8324 0000 0000 4400 0010 0000 8324 0002 d03f 4000 003c 0000 0018 0000 0000 4400 0010 0000 8330 0002 d04f 8000 0000
1216440 0000 0000 0000 0000 4400 000f 0000 8330 0000 0000 4400 0010 0000 8438 0000 0000 4400 0011 0000 843c 0000 0000 4400 0012
1216520 0000 8440 0000 0000 4400 0010 0000 8444 0000 0000 4400 0028 0000 8458 0000 0000 4400 0029 0000 8464 0002 d05c 8000 0000
```

```
1216600 0000 0000 0002 d071 8000 0034 ffff fb05 0002 d1c2 8000 0000 0000 0000 0002 d283 8000 0000 0000 0000 0002 d344 8000 0000
1216660 0000 0000 0002 d3fc 2000 0008 0000 0000 0002 d428 8000 0018 ffff fb05 0002 d4ba 8000 0000 0000 0000 0002 d582 8000 0000
1216740 0000 0000 0002 d5b8 2000 0008 0000 0000 0002 d5e1 8000 002c ffff fb05 0002 d695 8000 0000 0000 0000 0002 d768 8000 0000
1217020 0000 0000 0002 d7f4 2000 0008 0000 0000 0002 d81e 2400 0001 0000 8474 0002 d83c a000 002c 0000 0044 0002 d854 a000 0001
1217100 0000 0048 0002 d961 8400 0000 0000 8474 0000 0000 4400 000e 0000 8474 0002 d86f 4000 002c 0000 0018 0000 0000 4400 000e
1217160 0000 8484 0002 d87f 8000 0000 0000 0000 0002 d88c 8000 0000 0000 0000 0000 0000 4400 000f 0000 8484 0000 0000 4400 0011
1217240 0000 84a8 0000 0000 4400 0012 0000 84bc 0000 0000 4400 0013 0000 84d0 0000 0000 4400 0014 0000 84e4 0002 d896 8000 0000
1217320 0000 0000 0002 d3b2 2400 0001 0000 84f4 0002 d8d3 a000 002c 0000 0044 0000 0000 4400 0018 0000 84f4 0002 d8e3 4000 002c
1217400 0000 0018 0000 0000 4400 0018 0000 8500 0002 d8f3 8000 0008 ffff fffc 0002 d8ff 8000 000c ffff fff8 0002 d914 8000 008c
1217460 ffff fff4 0002 d929 8000 003c ffff fff0 0002 d935 8000 0034 ffff ffec 0002 d94a 8000 000c ffff ffe8 0002 d969 8000 000c
1217540 ffff ffe4 0002 d984 8000 0008 ffff ffe0 0002 d99e 8000 0008 ffff ffdc 0000 0000 c000 0002 0000 0340 0002 d9b5 8000 0000
1217620 0000 0000 0000 0000 4400 0020 0000 8500 0002 d9c2 8000 0000 0000 0000 0000 0000 4400 0021 0000 8500 0002 d9cc 8000 0000
1217700 0000 0000 0000 0000 4400 0022 0000 8500 0002 d9d6 8000 0000 0000 0000 0000 0000 4400 0023 0000 8500 0002 d9e0 8000 0000
1217760 0000 0000 0000 0000 4400 0024 0000 8500 0002 d9ea 8000 0000 0000 0000 0000 0000 4400 0025 0000 8500 0002 d9f4 8000 0000
1220040 0000 0000 0000 0000 4400 0026 0000 8500 0002 da08 8000 0000 0000 0000 0000 0000 4400 0027 0000 8500 0002 da20 8000 0000
1220120 0000 0000 0000 0000 4400 0028 0000 8500 0002 da38 8000 0000 0000 0000 0000 0000 4400 0029 0000 8500 0000 0000 4400 0020
1220200 0000 8500 0000 0000 4400 0021 0000 8518 0000 0000 4400 0022 0000 8524 0000 0000 4400 0023 0000 8530 0000 0000 4400 0024
1220260 0000 8549 0000 0000 4400 0025 0000 8574 0000 0000 4400 0026 0000 8588 0000 0000 4400 0027 0000 868c 0000 0000 4400 002a
1220340 0000 869c 0000 0000 4400 002b 0000 86b4 0000 0000 4400 002d 0000 86c8 0000 0000 4400 002f 0000 86d4 0000 0000 4400 0030
1220420 0000 87d8 0000 0000 4400 0020 0000 87e8 0002 da4d 8000 0008 ffff ffd4 0000 0000 c000 0003 0000 065c 0002 da5a 8000 0000
1220500 0000 0000 0000 0000 4400 0037 0000 881c 0000 0000 4400 0036 0000 881c 0000 0000 4400 0037 0000 8830 0000 0000 4400 0038
1220560 0000 8844 0000 0000 4400 0039 0000 8850 0000 0000 4400 003a 0000 8864 0000 0000 4400 003b 0000 8878 0000 0000 e000 0003
1220640 0000 0718 0000 0000 e000 0002 0000 0718 0000 0000 4400 003e 0000 88d8 0002 da65 8000 0000 0000 0000 0002 da84 2400 0018
1220720 0000 88e8 0002 daa8 a000 0018 0000 0044 0002 dab9 a000 0001 0000 0048 0002 dac6 8400 0000 0000 88e8 0000 0000 4400 0006
1221000 0000 88e9 0000 0009 4400 0006 0000 88fc 0002 dad7 8000 0000 0000 0000 0002 dae4 8000 0000 0000 0000 0000 0000 4400 0007
1221060 0000 88fc 0000 0000 4400 0004 0000 88fc 0000 0000 4400 0005 0000 89c8 0000 0000 4400 0016 0000 89d8 0000 0000 4400 0017
1221140 0000 89e4 0002 daee 8000 0000 0000 0000 0002 db06 2400 0001 0000 89f4 0002 db27 a000 002c 0000 0044 0002 db37 8400 0000
1221220 0000 89f4 0000 0000 4400 0041 0000 89f4 0002 db45 4000 002c 0000 0018 0000 0000 4400 0041 0000 8a00 0002 db55 8000 0008
1221300 ffff fffc 0002 db61 8000 000c ffff fff8 0002 db6e 8000 0034 ffff fff4 0002 db7b 8000 0018 ffff fff0 0002 db88 8000 000c
1221360 ffff ffec 0002 dba3 8000 0008 ffff ffe8 0002 dbbd 8000 0008 ffff ffe4 0000 0000 c000 0002 0000 0940 0002 dbd4 8000 0000
1221440 0000 0000 0000 0000 4400 0047 0000 8a00 0002 dbe1 8000 0000 0000 0000 0000 0000 4400 0048 0000 8a00 0002 dbeb 8000 0000
1221520 0000 0000 0000 0000 4400 0049 0000 8a00 0002 dbf5 8000 0000 0000 0000 0000 0000 4400 004a 0000 8a00 0002 dbff 8000 0000
1221600 0000 0000 0000 0000 4400 004b 0000 8a00 0002 dc09 8000 0000 0000 0000 0000 0000 4400 004c 0000 8a00 0002 dc21 8000 0000
1221660 0000 0000 0000 0000 4400 004d 0000 8a00 0002 dc39 8000 0000 0000 0000 0000 0000 4400 004e 0000 8a00 0000 0000 4400 0047
1221740 0000 8a00 0000 0000 4400 0048 0000 8a18 0000 0000 4400 0049 0000 8a24 0000 0000 4400 004a 0000 8a3c 0000 0000 4400 004b
1222020 0000 8a4c 0000 0000 4400 004c 0000 8a64 0000 0000 4400 004d 0000 8b68 0000 0000 4400 004f 0000 8b78 0000 0000 4400 0050
1222100 0000 8c7c 0000 0000 4400 0047 0000 8c90 0002 dc4e 8000 0008 ffff ffdc 0000 0000 c000 0003 0000 0b04 0002 dc5b 8000 0000
1222160 0000 0000 0000 0000 4400 0057 0000 8cc4 0000 0000 4400 0056 0000 8cc4 0000 0000 4400 0057 0000 8cd8 0000 0000 4400 0058
1222240 0000 8d00 0000 0000 4400 0059 0000 8d14 0000 0000 4400 005a 0000 8d20 0000 0000 4400 005b 0000 8d34 0000 0000 e000 0003
1222320 0000 0bd4 0000 0000 e000 0002 0000 0bd4 0000 0000 4400 005e 0000 8d94 0002 dc66 8000 0000 0000 0000 0002 dc85 2400 0001
1222400 0000 8da4 0002 dcac a000 002c 0000 0044 0000 0000 4400 0062 0000 8da4 0002 dcbc 4000 002c 0000 0018 0000 0000 4400 0062
1222460 0000 8db0 0002 dccc 8000 0008 ffff fffc 0002 dcd8 8000 008c ffff fff8 0000 0000 c000 0002 0000 0bf0 0002 dce5 8000 0000
1222540 0000 0000 0000 0000 4400 0065 0000 8db0 0002 dcf2 8000 0000 0000 0000 0000 0000 4400 0066 0000 8db0 0002 dcfc 8000 0000
1222620 0000 0000 0000 0000 4400 0067 0000 8db0 0000 0000 4400 0066 0000 8db0 0000 0000 4400 0067 0000 8dc8 0000 0000 4400 0068
1222700 0000 8dd4 0000 0000 4400 0069 0000 8e14 0000 0000 4400 0066 0000 9e20 0000 0000 e000 0002 0000 0c94 0000 0000 4400 006b
1222760 0000 8e54 0002 dd06 8000 0000 0000 0000 0002 dd2b 2400 0001 0000 8e64 0002 dd4f a000 002c 0000 0044 0000 0000 4400 006f
1223040 0000 8e64 0002 dd5f 4000 002c 0000 0018 0000 0000 4400 006f 0000 8e70 0002 dd6f 8000 0008 ffff fffc 0002 dd7b 8000 0018
1223120 ffff fff8 0000 0000 c000 0002 0000 0cb0 0002 dd88 8000 0000 0000 0000 0000 0000 4400 0073 0000 8e70 0002 dd95 8000 0000
1223200 0000 0000 0000 0000 4400 0074 0000 8e70 0002 dd9f 8000 0000 0000 0000 0000 0000 4400 0075 0000 8e70 0000 0000 4400 0074
1223260 0000 8e70 0000 0000 4400 0075 0000 8e88 0000 0000 4400 0076 0000 8e94 0000 0000 4400 0074 0000 8ea0 0000 0000 e000 0002
1223340 0000 0d14 0000 0000 4400 0078 0000 8ed4 0002 dda9 8000 0000 0000 0000 0002 ddcb 2400 0001 0000 8ee4 0002 ddf0 8400 0000
1223420 0000 8ee4 0000 0000 4400 023b 0000 8ee4 0000 0000 4400 023b 0000 8ef0 0000 0000 4400 023c 0000 8f00 0002 de0d 2400 0001
1223500 0000 8f10 0000 0000 4400 023b 0000 8f10 0000 0000 4400 023b 0000 8f1c 0000 0000 4400 023c 0000 8f30 0002 de32 2000 0008
1223560 0000 0000 0002 de62 2000 0008 0000 0000 0002 de9f 2400 0001 0000 8f40 0002 dec4 a000 0018 0000 0044 0002 ded5 a000 0001
1223640 0000 0048 0002 dee2 8400 0000 0000 8f40 0000 0000 4400 0009 0000 8f40 0002 def3 4000 0018 0000 0018 0000 0000 4400 0009
```

```
1223720 0000 8f50 0002 df04 8000 0000 0000 0000 0002 df11 8000 0000 0000 0000 0000 0000 4400 000a 0000 8f50 0000 0000 4400 0008
1224000 0000 8f50 0000 0000 4400 0009 0000 8f60 0000 0000 4400 000a 0000 8f70 0002 df1b 8000 0000 0000 0000 0002 df3e 2400 0001
1224060 0000 8f80 0002 df5b a000 000c 0000 0044 0002 df6c a000 0001 0000 0048 0002 df79 8400 0000 0000 8f80 0000 0000 4400 0012
1224140 0000 8f80 0002 dfa3 4000 000c 0000 0018 0000 0000 4400 0012 0000 8f90 0002 dfbe 8000 0000 0000 0000 0002 dfcb 8000 0000
1224220 0000 0000 0000 0000 4400 0013 0000 8f90 0000 0000 4400 0011 0000 8f90 0000 0000 4400 0012 0000 8fb4 0000 0000 4400 0013
1224300 0000 8fe8 0002 dfd5 8000 0000 0000 0000 0002 dff0 2400 0004 0000 8ff8 0002 e010 a000 0008 0000 0044 0002 e020 a000 0004
1224360 0000 0048 0002 e03a 8400 0000 0000 8ff8 0000 0000 4400 001b 0000 8ff8 0000 0000 4400 001b 0000 900c 0002 e06d 8000 0000
1224440 0000 0000 0002 e07a 8000 0000 0000 0000 0000 0000 4400 001c 0000 900c 0000 0000 4400 001a 0000 900c 0002 e088 8000 0000
1224520 0000 0000 0002 e0a6 2400 0004 0000 9028 0002 e0c6 a000 0008 0000 0044 0002 e0d6 a000 0004 0000 0048 0000 0000 4400 001a
1224600 0000 903c 0002 e0e8 8000 0000 0000 0000 0002 e0f5 8000 0000 0000 0000 0000 0000 4400 001b 0000 903c 0000 0000 4400 0019
1224660 0000 903c 0002 e103 8000 0000 0000 0000 0002 e121 2400 0001 0000 9058 0002 e13e a000 0008 0000 0044 0002 e14e a000 0001
1224740 0000 0048 0002 e15f a000 0008 0000 004c 0000 0000 4400 0019 0000 9074 0002 e170 8000 0000 0000 0000 0002 e17d 8000 0000
1225020 0000 0000 0000 0000 4400 001a 0000 9074 0002 e18b 8000 0000 0000 0000 0000 0000 4400 001b 0000 9074 0000 0000 4400 0018
1225100 0000 9074 0002 e199 8000 0000 0000 0000 0002 e1b4 2400 0001 0000 9084 0002 e1d1 a000 0008 0000 0044 0002 e1e1 a000 0001
1225160 0000 0048 0002 e1f2 a000 0004 0000 004c 0000 0000 4400 0018 0000 909c 0002 e202 8000 0000 0000 0000 0002 e20f 8000 0000
1225240 0000 0000 0000 0000 4400 0019 0000 909c 0002 e21d 8000 0000 0000 0000 0000 0000 4400 001a 0000 909c 0000 0000 4400 0017
1225320 0000 909c 0002 e22b 8000 0000 0000 0000 0002 e246 2400 0001 0000 90ac 0002 e264 a000 0008 0000 0044 0002 e274 a000 0001
1225400 0000 0048 0002 e285 a000 0001 0000 004c 0000 0000 4400 0017 0000 90c4 0002 e296 8000 0000 0000 0000 0002 e2a3 8000 0000
1225460 0000 0000 0000 0000 4400 0018 0000 90c4 0002 e2b1 8000 0000 0000 0000 0000 0000 4400 0019 0000 90c4 0000 0000 4400 0016
1225540 0000 90c4 0002 e2bf 8000 0000 0000 0000 0002 e2db 2400 0001 0000 90d4 0002 e2f9 a000 0008 0000 0044 0002 e309 a000 0001
1225620 0000 0048 0002 e31a a000 0004 0000 004c 0000 0000 4400 0016 0000 90ec 0002 e32a 8000 0000 0000 0000 0002 e337 8000 0000
1225700 0000 0000 0000 0000 4400 0017 0000 90ec 0002 e345 8000 0000 0000 0000 0000 0000 4400 0018 0000 90ec 0000 0000 4400 0015
1225760 0000 90ec 0002 e353 8000 0000 0000 0000 0002 e36e 2400 0001 0000 9138 0002 e38a a000 0008 0000 0044 0002 e39a a000 0004
1226040 0000 0048 0000 0000 4400 0015 0000 911c 0002 e3aa 8000 0000 0000 0000 0002 e3b7 8000 0000 0000 0000 0000 0000 4400 0016
1226120 0000 911c 0000 0000 4400 0014 0000 911c 0002 e3c5 8000 0000 0000 0000 0002 e3de 2400 0004 0000 9138 0002 e3ff a000 0004
1226200 0000 0044 0002 e410 a000 0004 0000 0048 0002 e422 8400 0000 0000 9138 0000 0000 4400 0015 0000 9138 0000 0000 4400 0015
1226260 0000 914c 0002 e454 8000 0000 0000 0000 0002 e461 8000 0000 0000 0000 0000 0000 4400 0016 0000 914c 0000 0000 4400 0014
1226340 0000 914c 0002 e46f 8000 0000 0000 0000 0002 e48e 0400 0000 0000 9168 0002 e49c 0400 0000 0000 aea4 0002 e4c5 0400 0000
1226420 0000 afb0 0002 e4dc 0400 0000 0000 afdc 0002 e4f3 0400 0000 0000 ae40 0002 e513 0400 0000 0000 b060 0002 e528 0400 0000
1226500 0000 9624 0002 e545 0400 0000 0000 ae00 0002 e564 0400 0000 0000 9168 0002 e575 0400 0000 0000 b004 0002 e58d 0600 0000
1226560 0003 d47c 0002 e594 0600 0000 0003 d43c 0002 e59f 0600 0000 0003 d400 0002 e5aa 0800 0000 0004 92c0 0002 e5b9 0400 0000
1226640 0000 941c 0002 e5c9 0400 0000 0000 af50 0002 e5e3 0400 0000 0000 af80 0002 e5fd 0400 0000 0000 aed8 0002 e614 0400 0000
1226720 0000 96dc 0002 e628 0400 0000 0000 b02c 0002 e63f 0400 0000 0000 92cc 0002 e650 0400 0000 0000 b090 0002 e66b 6400 0000
1227000 0000 9168 0002 e69b 6400 0000 0000 9168 0002 e6a9 8400 0000 0000 9169 0002 e6b9 8000 0000 0000 0000 0002 e6e3 8000 0000
1227060 0000 0000 0002 e6fd 8000 0000 0000 0000 0002 e728 8000 0000 0000 0000 0002 e74a 8000 0000 0000 0000 0002 e76d 8000 0000
1227140 0000 0000 0002 e793 8000 0000 0000 0000 0002 e7b5 8000 0000 0000 0000 0002 e7d6 8000 0000 0000 0000 0002 e7ef 8000 0000
1227220 0000 0000 0002 e80a 8000 0000 0000 0000 0002 e81e 8000 0000 0000 0000 0002 e830 8000 0004 ffff fb05 0002 e84e 8000 0008
1227300 ffff fb05 0002 e88b 8000 0001 ffff fb05 0002 e8a8 8000 0004 ffff fb05 0002 e8b6 2000 0004 0000 0000 0002 e8c3 2000 0004
1227360 0000 0000 0002 e8d3 2600 0001 0003 d400 0002 e8f8 8400 0000 0000 9168 0002 e92a 2600 0001 0003 d43c 0002 e94f 8400 0000
1227440 0000 9168 0002 e981 2600 0001 0003 d47c 0002 e9a2 8400 0000 0000 9168 0002 e9cf 8000 0001 ffff fb05 0002 ea58 8000 0004
1227520 ffff fb05 0002 ea67 8000 0000 ffff fb05 0002 ea88 8000 0004 ffff fb05 0002 ea99 2000 0004 0000 0000 0002 eaae 2000 0004
1227600 0000 0000 0002 eabe 2000 0004 0000 0000 0002 eadd 8000 0000 ffff fb05 0002 eafe 8000 0000 ffff fb05 0002 eb11 8000 0001
1227660 ffff fb05 0002 eb28 8000 0004 ffff fb05 0002 eb64 8000 0004 ffff fb05 0002 eba5 8000 0004 ffff fb05 0002 ebe3 8000 0004
1227740 ffff fb05 0002 ec1e 8000 0004 ffff fb05 0002 ec5c 8000 0004 ffff fb05 0002 ec7e 8000 0004 ffff fb05 0002 eca0 2000 0001
1230020 0000 0000 0002 ecaf 8000 0004 ffff fb05 0002 ecc0 8000 0004 ffff fb05 0002 ecd1 8000 0004 ffff fb05 0002 ed48 8000 0004
1230100 ffff fb05 0002 ede0 8000 0004 ffff fb05 0002 ee24 8000 0004 ffff fb05 0002 eea4 8000 0004 ffff fb05 0002 ef1e 8000 0004
1230160 ffff fb05 0002 ef4c 8000 003c ffff fb05 0002 f063 8000 003c ffff fb05 0002 f15f 2000 0004 0000 0000 0002 f176 2000 0004
1230240 0000 0000 0002 f18f 2000 0004 0000 0000 0002 f1a7 2000 0004 0000 0000 0002 f1bc 2000 0004 0000 0000 0002 f1d2 2000 0001
1230320 0000 0000 0002 f1eb 8000 0000 0000 0000 0002 f2b1 8000 0000 0000 0000 0002 f377 8000 0000 0000 0000 0002 f437 8000 0000
1230400 0000 0000 0002 f48b 8000 0028 ffff fb05 0002 f5a5 8000 0028 ffff fb05 0002 f60a 8000 0000 0000 0000 0002 f6d5 8000 0000
1230460 0000 0000 0002 f7a0 8000 0000 0000 0000 0002 f85e 8000 0000 0000 0000 0002 f922 8000 0000 0000 0000 0002 f9e7 8000 0000
1230540 0000 0000 0002 fa46 8000 0048 ffff fb05 0002 fac4 8000 0000 0000 0000 0002 fb88 8000 0000 0000 0000 0002 fc52 8000 0000
1230620 0000 0000 0002 fd27 8000 0000 0000 0000 0002 fdf3 8000 0000 0000 0000 0002 fe91 8000 0044 ffff fb05 0002 fee8 8000 0000
1230700 0000 0000 0002 ffae 8000 0000 0000 0000 0003 0079 8000 0000 0000 0000 0003 0146 8000 0000 0000 0000 0003 0188 2400 0044
1230760 0000 9168 0003 01a8 a000 0044 0000 0044 0003 01b8 a000 0001 0000 0048 0003 01c4 8400 0000 0000 9168 0000 0000 4400 01d1
```

```
1231040  0000 9168 0003 01e1 4000 0044 0000 0018 0000 0000 4400 01d1 0000 9178 0003 01f1 8000 0000 0000 0000 0003 01fe 8000 0000
1231120  0000 0000 0000 0000 4400 01d2 0000 9178 0000 0000 4400 01d3 0000 91ac 0000 0000 4400 01d4 0000 9250 0000 0000 4400 01d6
1231200  0000 9280 0000 0000 4400 01d8 0000 92b0 0000 0000 4400 01d9 0000 92bc 0003 0208 8000 0000 0000 0000 0003 021d 8000 0050
1231260  ffff fb05 0003 0298 8000 0000 0000 0000 0003 031f 2000 0000 0000 0000 0003 0341 2000 0000 0000 0000 0003 0364 2000 0000
1231340  0000 0000 0003 0371 2000 0000 0000 0000 0003 037e 8000 0001 ffff fb05 0003 03b9 2000 0004 0000 0000 0003 03db 2000 0004
1231420  0000 0000 0003 03fd 8000 0000 0000 0000 0003 048a 2800 0001 0004 92c0 0003 04a0 8000 0004 ffff fb05 0003 04ac 8000 0008
1231500  ffff fb05 0003 050f 8000 0000 0000 0000 0003 058b 8000 0004 ffff fb05 0003 05c0 8000 0000 0000 0000 0003 0614 8000 0008
1231560  ffff fb05 0003 067f 8000 0000 0000 0000 0003 06e5 8000 0004 ffff fb05 0003 071a 8000 0000 0000 0000 0003 0776 8000 0008
1231640  ffff fb05 0003 07d9 8000 0000 0000 0000 0003 083f 8000 0004 ffff fb05 0003 0874 8000 0000 0000 0000 0003 08d0 8000 0008
1231720  ffff fb05 0003 093e 8000 0000 0000 0000 0003 09cb 8000 0004 ffff fb05 0003 0a02 8000 0000 0000 0000 0003 0a64 8000 0008
1232000  ffff fb05 0003 0aba 8000 0000 0000 0000 0003 0b3b 8000 0004 ffff fb05 0003 0b72 8000 0000 0000 0000 0003 0bca 8000 0008
1232060  ffff fb05 0003 0c20 8000 0000 0000 0000 0003 0c8a 8000 0004 ffff fb05 0003 0cc1 8000 0000 0000 0000 0003 0d21 8000 0008
1232140  ffff fb05 0003 0d77 8000 0000 0000 0000 0003 0de1 8000 0004 ffff fb05 0003 0e18 8000 0000 0000 0000 0003 0e78 8000 0008
1232220  ffff fb05 0003 0ed1 8000 0000 0000 0000 0003 0f63 8000 0004 ffff fb05 0003 0f9c 8000 0000 0000 0000 0003 1002 8000 0034
1232300  ffff fb05 0003 111b 8000 0034 ffff fb05 0003 11fd 8000 0000 0000 0000 0003 12c7 8000 0000 0000 0000 0003 12f4 8000 0040
1232360  ffff fb05 0003 140c 8000 0040 ffff fb05 0003 1526 2000 0004 0000 0000 0003 1540 8000 0000 0000 0000 0003 160d 8000 0000
1232440  0000 0000 0003 16b8 8000 0084 ffff fb05 0003 173d 8000 0000 0000 0000 0003 1812 8000 0000 0000 0000 0003 188e 8000 0004
1232520  ffff fb05 0003 18a2 8000 0004 ffff fb05 0003 18d1 8000 0000 0000 0000 0003 1956 2000 0008 0000 0000 0003 197f 8000 0008
1232600  ffff fb05 0003 198a 8000 0008 ffff fb05 0003 1996 8000 0008 ffff fb05 0003 19a2 8000 0008 ffff fb05 0003 19ee 8000 0000
1232660  0000 0000 0003 1ab4 8000 0000 0000 0000 0003 1b16 8000 0044 ffff fb05 0003 1b78 8000 0000 0000 0000 0003 1c3e 8000 0000
1232740  0000 0000 0003 1c69 8000 0008 ffff fb05 0003 1c75 8000 000c ffff fb05 0003 1ce8 8000 0000 0000 0000 0003 1d74 8000 0008
1233020  ffff fb05 0003 1dc8 8000 000c 0000 0000 0003 1e48 8000 000c ffff fb05 0003 1ebe 8000 0000 0000 0000 0003 1f69 2000 0008
1233100  0000 0000 0003 1f94 8000 000c ffff fb05 0003 1ff9 8000 0000 0000 0000 0003 20ba 8000 0000 0000 0000 0003 212a 2000 0008
1233160  0000 0000 0003 2151 8000 000c ffff fb05 0003 21b7 8000 0000 0000 0000 0003 2285 8000 0000 0000 0000 0003 22f3 2000 0008
1233240  0000 0000 0003 231b 8000 0008 ffff fb05 0003 237f 8000 0000 0000 0000 0003 2426 8000 0010 ffff fb05 0003 24b7 8000 0000
1233320  0000 0000 0003 2568 8000 0018 ffff fb05 0003 25fa 8000 0000 0000 0000 0003 26ca 8000 0000 0000 0000 0003 2752 2000 0008
1233400  0000 0000 0003 277b 8000 0024 ffff fb05 0003 28c9 8000 0000 0000 0000 0003 2989 8000 0000 0000 0000 0003 2a1d 8000 0004
1233460  ffff fb05 0003 2a67 8000 0000 0000 0000 0003 2a7a 8000 0010 ffff fb05 0003 2b05 8000 0000 0000 0000 0003 2bc9 8000 0000
1233540  0000 0000 0003 2c88 8000 0000 0000 0000 0003 2c9f 2000 0008 0000 0000 0003 2cca 8000 003c ffff fb05 0003 2dd3 8000 003c
1233620  ffff fb05 0003 2e61 8000 0000 0000 0000 0003 2f24 8000 0000 0000 0000 0003 2ff6 8000 0000 0000 0000 0003 30c1 8000 0000
1233700  0000 0000 0003 319d 8000 0000 0000 0000 0003 3277 8000 0000 0000 0000 0003 333e 8000 0000 0000 0000 0003 338c 2000 0008
1233760  0000 0000 0003 33b8 8000 001c ffff fb05 0003 345e 8000 0000 0000 0000 0003 3536 8000 0000 0000 0000 0003 360a 8000 0000
1234040  0000 0000 0003 36e0 8000 0000 0000 0000 0003 3703 2000 0008 0000 0000 0003 3737 8000 003c ffff fb05 0003 3839 8000 003c
1234120  ffff fb05 0003 38a0 8000 0000 0000 0000 0003 3966 8000 0000 0000 0000 0003 3a23 8000 0000 0000 0000 0003 3ab6 2000 0008
1234200  0000 0000 0003 3adf 8000 008c ffff fb05 0003 3bdb 8000 008c ffff fb05 0003 3c86 8000 0000 0000 0000 0003 3d53 8000 0000
1234260  0000 0000 0003 3e1c 8000 0000 0000 0000 0003 3edf 8000 0000 0000 0000 0003 3f65 2000 0008 0000 0000 0003 3f8d 2400 003c
1234340  0000 92cc 0003 3faf a000 003c 0000 0044 0003 3fc0 8400 0000 0000 92cc 0000 0000 4400 0010 0000 92cc 0003 3fd1 4000 003c
1234420  0000 0018 0000 0000 4400 0010 0000 92d8 0003 3fe2 8000 0000 0000 0000 0000 0000 4400 000f 0000 92d8 0000 0000 4400 0010
1234500  0000 93e0 0000 0000 4400 0011 0000 93e4 0000 0000 4400 0012 0000 93e8 0000 0000 4400 0010 0000 93ec 0000 0000 4400 0028
1234560  0000 9400 0000 0000 4400 0029 0000 940c 0003 3fef 8000 0000 0000 0000 0003 4004 8000 0034 ffff fb05 0003 4158 8000 0000
1234640  0000 0000 0003 4219 8000 0000 0000 0000 0003 42da 8000 0000 0000 0000 0003 4392 2000 0008 0000 0000 0003 43c0 8000 0018
1234720  ffff fb05 0003 4454 8000 0000 0000 0000 0003 451c 8000 0000 0000 0000 0003 4552 2000 0008 0000 0000 0003 457d 8000 002c
1235000  ffff fb05 0003 4635 8000 0000 0000 0000 0003 4708 8000 0000 0000 0000 0003 4794 2000 0008 0000 0000 0003 47c0 8000 0004
1235060  ffff fb05 0003 481c 8000 0004 ffff fb05 0003 486d 8000 0004 ffff fb05 0003 48ca 8000 0004 ffff fb05 0003 4920 8000 0004
1235140  ffff fb05 0003 4943 2000 000c 0000 0000 0003 4957 8400 0000 0000 941c 0003 4967 2000 008c 0000 0000 0003 497b 2000 003c
1235220  0000 0000 0003 4986 2000 001c 0000 0000 0003 499a 2000 003c 0000 0000 0003 49a5 2000 0010 0000 0000 0003 49b9 2000 0004
1235300  0000 0000 0003 49c5 2000 0001 0000 0000 0003 49d2 2400 008c 0000 941c 0003 49ea a000 008c 0000 0044 0003 49fb 8400 0000
1235360  0000 941c 0000 0000 4400 0012 0000 941c 0003 4a0b 4000 008c 0000 0018 0000 0000 4400 0012 0000 9428 0003 4a1c 8000 0000
1235440  0000 0000 0000 0000 4400 0011 0000 9428 0000 0000 4400 0012 0000 9600 0000 0000 4400 0013 0000 9604 0000 0000 4400 0034
1235520  0000 9608 0000 0000 4400 0035 0000 9614 0003 4a29 8000 0000 0000 0000 0003 4a3d 2400 001c 0000 9624 0003 4a62 a000 001c
1235600  0000 0044 0003 4a73 a000 0001 0000 0048 0003 4a80 8400 0000 0000 9624 0000 0000 4400 0009 0000 9624 0003 4a94 4000 001c
1235660  0000 0018 0000 0000 4400 0009 0000 9634 0003 4aa5 8000 0000 0000 0000 0003 4ab2 8000 0000 0000 0000 0000 0000 4400 000a
1235740  0000 9634 0000 0000 4400 0007 0000 9634 0000 0000 4400 0008 0000 96a0 0000 0000 4400 001f 0000 96c0 0000 0000 4400 0020
1236020  0000 96cc 0003 4abc 8000 0000 0000 0000 0003 4add 2400 003c 0000 96dc 0003 4af9 a000 003c 0000 0044 0003 4b0a 8400 0000
1236100  0000 96dc 0000 0000 4400 0006 0000 96dc 0003 4b1e 4000 003c 0000 0018 0000 0000 4400 0006 0000 96e8 0003 4b2f 8000 0000
```

```
1236160  0000 0000 0000 0000 4400 0005 0000 96e8 0000 0000 4400 0006 0000 9754 0000 0000 4400 0007 0000 9758 0000 0000 4400 0008
1236240  0000 975c 0000 0000 4400 0006 0000 9760 0000 0000 4400 0007 0000 9768 0000 0000 4400 0044 0000 9774 0000 0000 4400 0045
1236320  0000 9780 0003 4b3c 8000 0000 0000 0000 0003 4b54 2400 0001 0000 9790 0003 4b7c a000 002c 0000 0044 0003 4b96 a000 0001
1236400  0000 0048 0003 4baf 8400 0000 0000 9790 0000 0000 4400 0044 0000 9790 0003 4bbf 4000 002c 0000 0018 0000 0000 4400 0044
1236460  0000 97a0 0003 4bd0 8000 0004 ffff fffc 0003 4be2 8000 0004 ffff fff8 0003 4bf1 8000 0004 ffff fff4 0003 4c03 8000 0004
1236540  ffff fff0 0003 4c15 8000 0004 ffff ffec 0003 4c24 8000 0004 ffff ffe8 0003 4c33 8000 0004 ffff ffe4 0003 4c43 8000 0004
1236620  ffff ffe0 0003 4c56 8000 0000 ffff ffdc 0003 4c63 8000 000c ffff ffd8 0003 4c7b 8000 000c ffff ffd4 0003 4c8e 8000 0000
1236700  ffff ffd0 0003 4ca4 8000 000c ffff ffcc 0003 4cbf 0000 0008 ffff ffc8 0003 4cd6 8000 0008 ffff ffc4 0003 4cf0 8000 0008
1236760  ffff ffc0 0003 4107 8000 008c ffff ffbc 0003 4d22 8000 008c ffff ffb8 0003 4d3d 8000 008c ffff ffb4 0003 4d58 0000 008c
1237040  ffff ffb0 0003 4473 4000 008c 0000 001d 0003 4d8f 8000 0001 ffff ffac 0003 4da6 8000 008c ffff ffa8 0003 4dc1 4000 003c
1237120  0000 001c 0003 4ddd 8000 0001 ffff ffa4 0003 4df4 8000 003c ffff ffa0 0003 4e0f 8000 0001 ffff ff9c 0003 4e26 8000 003c
1237200  ffff ff98 0003 4e41 8000 0001 ffff ff94 0003 4e58 4000 003c 0000 001b 0003 4e74 8000 0001 ffff ff90 0003 4e8b 8000 003c
1237260  ffff ff8c 0003 4ea6 4000 003c 0000 001a 0003 4ec2 8000 0001 ffff ff88 0003 4ed9 4000 003c 0000 0019 0003 4ef5 8000 0001
1237340  ffff ff84 0003 4f0c 8000 003c ffff ff80 0003 4f27 8000 0004 ffff ff7c 0003 4f40 8000 003c ffff ff78 0003 4f5b 8000 0004
1237420  ffff ff74 0003 4f74 8000 003c ffff ff70 0003 4f8f 8000 0004 ffff ff6c 0000 0000 c000 0002 0000 0638 0003 4fa8 8000 0000
1237500  0000 0000 0000 0000 4400 005c 0000 97a0 0003 4fb5 8000 0000 0000 0000 0000 0000 4400 005d 0000 97a0 0003 4fcb 8000 0000
1237560  0000 0000 0000 0000 4400 005e 0000 97a0 0003 4fdc 8000 0000 0000 0000 0000 0000 4400 005f 0000 97a0 0003 4fea 8000 0000
1237640  0000 0000 0000 0000 4400 0060 0000 97a0 0003 4ffb 8000 0000 0000 0000 0000 0000 4400 0061 0000 97a0 0003 500c 8000 0000
1237720  0000 0000 0000 0000 4400 0062 0000 97a0 0003 501a 8000 0000 0000 0000 0000 0000 4400 0063 0000 97a0 0003 5029 8000 0000
1240000  0000 0000 0000 0000 4400 0064 0000 97a0 0003 5037 8000 0000 0000 0000 0000 0000 4400 0065 0000 97a0 0003 5048 8000 0000
1240060  0000 0000 0000 0000 4400 0066 0000 97a0 0003 5053 8000 0000 0000 0000 0000 0000 4400 0067 0000 97a0 0003 5060 8000 0000
1240140  0000 0000 0000 0000 4400 0068 0000 97a0 0003 5070 8000 0000 0000 0000 0000 0000 4400 0069 0000 97a0 0003 5084 8000 0000
1240220  0000 0000 0000 0000 4400 006a 0000 97a0 0003 509c 8000 0000 0000 0000 0000 0000 4400 006b 0000 97a0 0003 50b1 8000 0000
1240300  0000 0000 0000 0000 4400 006c 0000 97a0 0003 50c9 8000 0000 0000 0000 0000 0000 4400 006d 0000 97a0 0003 50de 8000 0000
1240360  0000 0000 0000 0000 4400 006e 0000 97a0 0003 50f6 8000 0000 0000 0000 0000 0000 4400 006f 0000 97a0 0003 510e 8000 0000
1240440  0000 0000 0000 0000 4400 0070 0000 97a0 0003 5126 8000 0000 0000 0000 0000 0000 4400 0071 0000 97a0 0003 513e 8000 0000
1240520  0000 0000 0000 0000 4400 0072 0000 97a0 0003 5156 8000 0000 0000 0000 0000 0000 4400 0073 0000 97a0 0003 516b 8000 0000
1240600  0000 0000 0000 0000 4400 0074 0000 97a0 0003 5183 8000 0000 0000 0000 0000 0000 4400 0075 0000 97a0 0003 519b 8000 0000
1240660  0000 0000 0000 0000 4400 0076 0000 97a0 0003 51b0 8000 0000 0000 0000 0000 0000 4400 0077 0000 97a0 0003 51c8 8000 0000
1240740  0000 0000 0000 0000 4400 0078 0000 97a0 0003 51dd 8000 0000 0000 0000 0000 0000 4400 0079 0000 97a0 0003 51f5 8000 0000
1241020  0000 0000 0000 0000 4400 007a 0000 97a0 0003 520a 8000 0000 0000 0000 0000 0000 4400 007b 0000 97a0 0003 5222 8000 0000
1241100  0000 0000 0000 0000 4400 007c 0000 97a0 0003 5237 8000 0000 0000 0000 0000 0000 4400 007d 0000 97a0 0003 524f 8000 0000
1241160  0000 0000 0000 0000 4400 007e 0000 97a0 0003 5267 8000 0000 0000 0000 0000 0000 4400 007f 0000 97a0 0003 527c 8000 0000
1241240  0000 0000 0000 0000 4400 0080 0000 97a0 0003 5294 8000 0000 0000 0000 0000 0000 4400 0081 0000 97a0 0003 52a9 8000 0000
1241320  0000 0000 0000 0000 4400 0082 0000 97a0 0003 52c1 8000 0000 0000 0000 0000 0000 4400 0083 0000 97a0 0003 52d9 8000 0000
1241400  0000 0000 0000 0000 4400 0084 0000 97a0 0003 52f1 8000 0000 0000 0000 0000 0000 4400 0085 0000 97a0 0003 5309 8000 0000
1241460  0000 0000 0000 0000 4400 0086 0000 97a0 0003 5321 8000 0000 0000 0000 0000 0000 4400 0087 0000 97a0 0000 0000 4400 0046
1241540  0000 97a0 0000 0000 4400 0047 0000 97a4 0000 0000 4400 0048 0000 97a8 0000 0000 4400 0049 0000 97ac 0000 0000 4400 004a
1241620  0000 97b0 0000 0000 4400 004b 0000 97b8 0000 0000 4400 004c 0000 97c0 0000 0000 4400 0054 0000 97c4 0000 0000 4400 0055
1241700  0000 97dc 0000 0000 4400 0056 0000 97ec 0000 0000 4400 0058 0000 980c 0000 0000 4400 005a 0000 9820 0000 0000 4400 005c
1241760  0000 982c 0000 0000 4400 005d 0000 9860 0000 0000 4400 005f 0000 9878 0000 0000 4400 0060 0000 9894 0000 0000 4400 0061
1242040  0000 98b0 0000 0000 4400 0062 0000 98cc 0000 0000 4400 0063 0000 98e8 0000 0000 4400 0064 0000 9904 0000 0000 4400 0065
1242120  0000 9920 0000 0000 4400 0066 0000 993c 0000 0000 4400 0067 0000 9958 0000 0000 4400 0068 0000 9974 0000 0000 4400 0069
1242200  0000 9990 0000 0000 4400 006a 0000 99ac 0000 0000 4400 006b 0000 99c8 0000 0000 4400 006c 0000 99e4 0000 0000 4400 006d
1242260  0000 9a00 0000 0000 4400 006e 0000 9a1c 0000 0000 4400 006f 0000 9a38 0000 0000 4400 0070 0000 9a54 0000 0000 4400 0071
1242340  0000 9a70 0000 0000 4400 0072 0000 9a8c 0000 0000 4400 0073 0000 9aa8 0000 0000 4400 0074 0000 9ac4 0000 0000 4400 0075
1242420  0000 9ae0 0000 0000 4400 0076 0000 9afc 0000 0000 4400 0077 0000 9b18 0000 0000 4400 0078 0000 9b34 0000 0000 4400 0079
1242500  0000 9b50 0000 0000 4400 007a 0000 9b6c 0000 0000 4400 007b 0000 9b88 0000 0000 4400 007c 0000 9ba4 0000 0000 4400 007e
1242560  0000 9bc0 0000 0000 4400 0080 0000 9bdc 0000 0000 4400 0081 0000 9bf8 0000 0000 4400 0082 0000 9c18 0000 0000 4400 0085
1242640  0000 9c20 0000 0000 4400 0086 0000 9c44 0000 0000 4400 0087 0000 9c58 0000 0000 4400 0088 0000 9d68 0000 0000 4400 0089
1242720  0000 9d74 0000 0000 4400 008c 0000 9d90 0000 0000 4400 008e 0000 9db0 0000 0000 4400 008f 0000 9db8 0000 0000 4400 0090
1243000  0000 9dc0 0000 0000 4400 0094 0000 9dc8 0000 0000 4400 0095 0000 9dd0 0000 0000 4400 0098 0000 9dd8 0000 0000 4400 0099
1243060  0000 9e10 0000 0000 4400 009c 0000 9e34 0000 0000 4400 009d 0000 9e54 0000 0000 4400 009e 0000 9e5c 0000 0000 4400 009f
1243140  0000 9e64 0000 0000 4400 00a2 0000 9e6c 0000 0000 4400 00a3 0000 9e84 0000 0000 4400 00a4 0000 9e8c 0000 0000 4400 00a5
1243220  0000 9e94 0000 0000 4400 00a6 0000 9e9c 0000 0000 4400 00a9 0000 9ea4 0000 0000 4400 00aa 0000 9ebc 0000 0000 4400 00ab
```

| | | | | | | | | | | | | | | | | | | | | | | | | |
|---|---|---|---|---|---|---|---|---|---|---|---|---|---|---|---|---|---|---|---|---|---|---|---|---|
| 1243300 | 0000 | 9ec4 | 0000 | 0000 | 4400 | 00ac | 0000 | 9ecc | 0000 | 0000 | 4400 | 00ad | 0000 | 9ed4 | 0000 | 0000 | 4400 | 00b0 | 0000 | 9edc | 0000 | 0000 | 4400 | 00b1 |
| 1243360 | 0000 | 9ef4 | 0000 | 0000 | 4400 | 00b2 | 0000 | 9efc | 0000 | 0000 | 4400 | 00b3 | 0000 | 9f04 | 0000 | 0000 | 4400 | 00b4 | 0000 | 9f0c | 0000 | 0000 | 4400 | 00ba |
| 1243440 | 0000 | 9f14 | 0000 | 0000 | 4400 | 00bd | 0000 | 9f1c | 0000 | 0000 | 4400 | 00be | 0000 | 9f29 | 0000 | 0000 | 4400 | 00bf | 0000 | 9f39 | 0000 | 0000 | 4400 | 00c0 |
| 1243520 | 0000 | 9f3c | 0000 | 0000 | 4400 | 00c1 | 0000 | 9f44 | 0000 | 0000 | 4400 | 00c2 | 0000 | 9f4c | 0000 | 0000 | 4400 | 00c3 | 0000 | 9f54 | 0000 | 0000 | 4400 | 00c5 |
| 1243600 | 0000 | 9f64 | 0000 | 0000 | 4400 | 00c6 | 0000 | 9f74 | 0000 | 0000 | 4400 | 00c7 | 0000 | 9f7c | 0000 | 0000 | 4400 | 00c9 | 0000 | 9f8c | 0000 | 0000 | 4400 | 00ca |
| 1243660 | 0000 | 9f9c | 0000 | 0000 | 4400 | 00cc | 0000 | 9fa4 | 0000 | 0000 | 4400 | 00cf | 0000 | 9fac | 0000 | 0000 | 4400 | 00d0 | 0000 | 9fb8 | 0000 | 0000 | 4400 | 00d4 |
| 1243740 | 0000 | 9fc0 | 0000 | 0000 | 4400 | 00e2 | 0000 | 9fc8 | 0000 | 0000 | 4400 | 00e3 | 0000 | 9fd0 | 0000 | 0000 | 4400 | 00e7 | 0000 | 9fd8 | 0000 | 0000 | 4400 | 00e9 |
| 1244020 | 0000 | 9fe0 | 0000 | 0000 | 4400 | 00ea | 0000 | a014 | 0000 | 0000 | 4400 | 00ed | 0000 | a01c | 0000 | 0000 | 4400 | 00ee | 0000 | a024 | 0000 | 0000 | 4400 | 00ef |
| 1244100 | 0000 | a038 | 0000 | 0000 | 4400 | 00f0 | 0000 | a040 | 0000 | 0000 | 4400 | 00f3 | 0000 | a049 | 0000 | 0000 | 4400 | 00f4 | 0000 | a050 | 0000 | 0000 | 4400 | 00f5 |
| 1244160 | 0000 | a068 | 0000 | 0000 | 4400 | 00f6 | 0000 | a070 | 0000 | 0000 | 4400 | 00f9 | 0000 | a079 | 0000 | 0000 | 4400 | 00fa | 0000 | a0b0 | 0000 | 0000 | 4400 | 00fb |
| 1244240 | 0000 | a0cc | 0000 | 0000 | 4400 | 00fc | 0000 | a0e4 | 0000 | 0000 | 4400 | 00fd | 0000 | a1f4 | 0000 | 0000 | 4400 | 00fe | 0000 | a210 | 0000 | 0000 | 4400 | 0101 |
| 1244320 | 0000 | a22c | 0000 | 0000 | 4400 | 0102 | 0000 | a24c | 0000 | 0000 | 4400 | 0105 | 0000 | a254 | 0000 | 0000 | 4400 | 0106 | 0000 | a288 | 0000 | 0000 | 4400 | 0109 |
| 1244400 | 0000 | a290 | 0000 | 0000 | 4400 | 010a | 0000 | a2bc | 0000 | 0000 | 4400 | 010d | 0000 | a2c4 | 0000 | 0000 | 4400 | 010e | 0000 | a2e8 | 0000 | 0000 | 4400 | 0111 |
| 1244460 | 0000 | a2f0 | 0000 | 0000 | 4400 | 0112 | 0000 | a31c | 0000 | 0000 | 4400 | 0115 | 0000 | a324 | 0000 | 0000 | 4400 | 0116 | 0000 | a358 | 0000 | 0000 | 4400 | 0117 |
| 1244540 | 0000 | a36c | 0000 | 0000 | 4400 | 0118 | 0000 | a47c | 0000 | 0000 | 4400 | 0119 | 0000 | a48c | 0000 | 0000 | 4400 | 011a | 0000 | a4c0 | 0000 | 0000 | 4400 | 011d |
| 1244620 | 0000 | a4e0 | 0000 | 0000 | 4400 | 011e | 0000 | a500 | 0000 | 0000 | 4400 | 0121 | 0000 | a508 | 0000 | 0000 | 4400 | 0122 | 0000 | a528 | 0000 | 0000 | 4400 | 0124 |
| 1244700 | 0000 | a564 | 0000 | 0000 | 4400 | 0125 | 0000 | a584 | 0000 | 0000 | 4400 | 0128 | 0000 | a58c | 0000 | 0000 | 4400 | 0129 | 0000 | a5ac | 0000 | 0000 | 4400 | 012b |
| 1244760 | 0000 | a5d8 | 0000 | 0000 | 4400 | 012c | 0000 | a5f8 | 0000 | 0000 | 4400 | 012f | 0000 | a600 | 0000 | 0000 | 4400 | 0130 | 0000 | a620 | 0000 | 0000 | 4400 | 0132 |
| 1245040 | 0000 | a65c | 0000 | 0000 | 4400 | 0133 | 0000 | a67c | 0000 | 0000 | 4400 | 0136 | 0000 | a684 | 0000 | 0000 | 4400 | 0137 | 0000 | a6a4 | 0000 | 0000 | 4400 | 0139 |
| 1245120 | 0000 | a6cc | 0000 | 0000 | 4400 | 013a | 0000 | a6ec | 0000 | 0000 | 4400 | 013d | 0000 | a6f4 | 0000 | 0000 | 4400 | 013e | 0000 | a720 | 0000 | 0000 | 4400 | 0141 |
| 1245200 | 0000 | a728 | 0000 | 0000 | 4400 | 0142 | 0000 | a754 | 0000 | 0000 | 4400 | 0145 | 0000 | a75c | 0000 | 0000 | 4400 | 0146 | 0000 | a788 | 0000 | 0000 | 4400 | 0149 |
| 1245260 | 0000 | a790 | 0000 | 0000 | 4400 | 00e7 | 0000 | a7b8 | 0000 | 0000 | 4400 | 014c | 0000 | a834 | 0000 | 0000 | 4400 | 014f | 0000 | a83c | 0000 | 0000 | 4400 | 0151 |
| 1245340 | 0000 | a844 | 0000 | 0000 | 4400 | 0152 | 0000 | a84c | 0000 | 0000 | 4400 | 0153 | 0000 | a864 | 0000 | 0000 | 4400 | 0154 | 0000 | a86c | 0000 | 0000 | 4400 | 0157 |
| 1245420 | 0000 | a874 | 0000 | 0000 | 4400 | 014f | 0000 | a89c | 0000 | 0000 | 4400 | 0159 | 0000 | a8b4 | 0000 | 0000 | 4400 | 015c | 0000 | a8bc | 0000 | 0000 | 4400 | 015e |
| 1245500 | 0000 | a8c4 | 0000 | 0000 | 4400 | 015f | 0000 | adcc | 0000 | 0000 | 4400 | 0160 | 0000 | a8e4 | 0000 | 0000 | 4400 | 0161 | 0000 | adec | 0000 | 0000 | 4400 | 0164 |
| 1245560 | 0000 | a8f4 | 0000 | 0000 | 4400 | 015c | 0000 | a91c | 0000 | 0000 | 4400 | 0166 | 0000 | a934 | 0000 | 0000 | 4400 | 0169 | 0000 | a93c | 0000 | 0000 | 4400 | 0082 |
| 1245640 | 0000 | a964 | 0000 | 0000 | 4400 | 016d | 0000 | aa1c | 0000 | 0000 | 4400 | 016f | 0000 | aa34 | 0000 | 0000 | 4400 | 0170 | 0000 | aa40 | 0000 | 0000 | e000 | 0002 |
| 1245720 | 0000 | 13e8 | 0000 | 0000 | 4400 | 0171 | 0000 | aa50 | 0003 | 5339 | 8000 | 0000 | 0000 | 0000 | 0003 | 535f | 2400 | 0001 | 0000 | aa60 | 0003 | 5379 | a000 | 0004 |
| 1246000 | 0000 | 0044 | 0003 | 538c | a000 | 0004 | 0000 | 0048 | 0003 | 539b | a000 | 0001 | 0000 | 004c | 0000 | 0000 | 4400 | 0175 | 0000 | aa60 | 0000 | 0000 | 4400 | 0175 |
| 1246060 | 0000 | aa78 | 0003 | 53ac | 8000 | 001c | ffff | fffc | 0003 | 53c7 | 8000 | 003c | ffff | fff8 | 0003 | 53e2 | 8000 | 0010 | ffff | fff4 | 0003 | 53fd | 8000 | 0010 |
| 1246140 | ffff | fff0 | 0003 | 5418 | 8000 | 0004 | ffff | ffec | 0003 | 542e | 8000 | 0010 | ffff | ffe8 | 0003 | 5449 | 8000 | 0004 | ffff | ffe4 | 0003 | 545f | 8000 | 0010 |
| 1246220 | ffff | ffe0 | 0000 | 0000 | c000 | 0002 | 0000 | 1910 | 0003 | 547a | 8000 | 0000 | 0000 | 0000 | 0000 | 0000 | 4400 | 0176 | 0000 | aa78 | 0003 | 548b | 8000 | 0000 |
| 1246300 | 0000 | 0000 | 0000 | 0000 | 4400 | 0177 | 0000 | aa78 | 0003 | 5498 | 8000 | 0000 | 0000 | 0000 | 0000 | 0000 | 4400 | 0178 | 0000 | aa78 | 0003 | 54a6 | 8000 | 0000 |
| 1246360 | 0000 | 0000 | 0000 | 0000 | 4400 | 0179 | 0000 | aa78 | 0003 | 54be | 8000 | 0000 | 0000 | 0000 | 0000 | 0000 | 4400 | 017a | 0000 | aa78 | 0003 | 54d6 | 8000 | 0000 |
| 1246440 | 0000 | 0000 | 0000 | 0000 | 4400 | 017b | 0000 | aa78 | 0003 | 54ee | 8000 | 0000 | 0000 | 0000 | 0000 | 0000 | 4400 | 017c | 0000 | aa78 | 0003 | 5506 | 8000 | 0000 |
| 1246520 | 0000 | 0000 | 0000 | 0000 | 4400 | 017d | 0000 | aa78 | 0003 | 551b | 8000 | 0000 | 0000 | 0000 | 0000 | 0000 | 4400 | 017e | 0000 | aa78 | 0003 | 5533 | 8000 | 0000 |
| 1246600 | 0000 | 0000 | 0000 | 0000 | 4400 | 017f | 0000 | aa78 | 0003 | 5548 | 8000 | 0000 | 0000 | 0000 | 0000 | 0000 | 4400 | 0180 | 0000 | aa78 | 0000 | 0000 | 4400 | 0177 |
| 1246660 | 0000 | aa78 | 0000 | 0000 | 4400 | 017a | 0000 | aa80 | 0000 | 0000 | 4400 | 017b | 0000 | aa9c | 0000 | 0000 | 4400 | 017e | 0000 | aaa4 | 0000 | 0000 | 4400 | 017f |
| 1246740 | 0000 | aac0 | 0000 | 0000 | 4400 | 0182 | 0000 | aac8 | 0000 | 0000 | 4400 | 0177 | 0000 | aaf0 | 0000 | 0000 | 4400 | 0185 | 0000 | ab18 | 0000 | 0000 | 4400 | 0187 |
| 1247020 | 0000 | ab20 | 0000 | 0000 | 4400 | 0188 | 0000 | ab40 | 0000 | 0000 | 4400 | 018a | 0000 | ab48 | 0000 | 0000 | 4400 | 018b | 0000 | ab70 | 0000 | 0000 | 4400 | 018d |
| 1247100 | 0000 | ab78 | 0000 | 0000 | 4400 | 018e | 0000 | aba4 | 0000 | 0000 | 4400 | 0191 | 0000 | abac | 0000 | 0000 | 4400 | 0185 | 0000 | abd4 | 0000 | 0000 | 4400 | 0194 |
| 1247160 | 0000 | abfc | 0000 | 0000 | 4400 | 0195 | 0000 | ac18 | 0000 | 0000 | e000 | 0002 | 0000 | 1ab8 | 0000 | 0000 | 4400 | 0196 | 0000 | ac20 | 0003 | 5560 | 8000 | 0000 |
| 1247240 | 0000 | 0000 | 0003 | 5578 | 2400 | 0001 | 0000 | ac30 | 0003 | 558f | a000 | 0004 | 0000 | 0044 | 0003 | 55a2 | a000 | 0001 | 0000 | 0048 | 0000 | 0000 | 4400 | 019b |
| 1247320 | 0000 | ac30 | 0000 | 0000 | 4400 | 019b | 0000 | ac44 | 0003 | 55b2 | 4000 | 001c | 0000 | 001d | 0003 | 55ce | 8000 | 0001 | ffff | fffc | 0003 | 55e5 | 8000 | 003c |
| 1247400 | ffff | fff8 | 0000 | 0000 | c000 | 0002 | 0000 | 1a1c | 0003 | 5600 | 8000 | 0000 | 0000 | 0000 | 0000 | 0000 | 4400 | 019c | 0000 | ac44 | 0003 | 5611 | 8000 | 0000 |
| 1247460 | 0000 | 0000 | 0000 | 0000 | 4400 | 019d | 0000 | ac44 | 0003 | 561e | 8000 | 0000 | 0000 | 0000 | 0000 | 0000 | 4400 | 019e | 0000 | ac44 | 0003 | 5636 | 8000 | 0000 |
| 1247540 | 0000 | 0000 | 0000 | 0000 | 4400 | 019f | 0000 | ac44 | 0003 | 564b | 8000 | 0000 | 0000 | 0000 | 0000 | 0000 | 4400 | 01a0 | 0000 | ac44 | 0000 | 0000 | 4400 | 019c |
| 1247620 | 0000 | ac44 | 0000 | 0000 | 4400 | 019e | 0000 | ac4c | 0000 | 0000 | 4400 | 019f | 0000 | ac6c | 0000 | 0000 | 4400 | 01a2 | 0000 | ac74 | 0000 | 0000 | 4400 | 01a3 |
| 1247700 | 0000 | aca0 | 0000 | 0000 | 4400 | 01a5 | 0000 | aca8 | 0000 | 0000 | 4400 | 01a6 | 0000 | acd8 | 0000 | 0000 | 4400 | 01a8 | 0000 | ace0 | 0000 | 0000 | 4400 | 019c |
| 1247760 | 0000 | ad08 | 0000 | 0000 | e000 | 0002 | 0000 | 1be4 | 0000 | 0000 | 4400 | 01aa | 0000 | ad4c | 0003 | 5663 | 8000 | 0000 | 0000 | 0000 | 0003 | 5678 | 2400 | 0001 |
| 1250040 | 0000 | ad5c | 0003 | 568e | a000 | 0004 | 0000 | 0044 | 0003 | 569f | a000 | 0004 | 0000 | 0048 | 0003 | 56b1 | a000 | 0001 | 0000 | 004c | 0000 | 0000 | 4400 | 01af |
| 1250120 | 0000 | ad5c | 0000 | 0000 | 4400 | 01af | 0000 | ad74 | 0003 | 56c1 | 8000 | 0000 | 0000 | 0000 | 0003 | 56d0 | 8000 | 0000 | 0000 | 0000 | 0000 | 0000 | 4400 | 01b0 |
| 1250200 | 0000 | ad74 | 0003 | 56e0 | 8000 | 0000 | 0000 | 0000 | 0000 | 0000 | 4400 | 01b1 | 0000 | ad74 | 0000 | 0000 | 4400 | 01b0 | 0000 | a474 | 0000 | 0000 | 4400 | 01b1 |
| 1250260 | 0000 | ad94 | 0003 | 56ed | 8000 | 0000 | 0000 | 0000 | 0003 | 5701 | 2400 | 0001 | 0000 | ada4 | 0003 | 572a | 8400 | 0000 | 0000 | ada4 | 0000 | 0000 | 4400 | 023b |
| 1250340 | 0000 | ada4 | 0000 | 0000 | 4400 | 023b | 0000 | adb0 | 0000 | 0000 | 4400 | 023c | 0000 | adc0 | 0003 | 5747 | 2400 | 0001 | 0000 | add0 | 0000 | 0000 | 4400 | 023b |

```
1250420  0000 add0 0000 0000 4400 023b 0000 addc 0000 0000 4400 023c 0000 adf0 0003 5770 2000 0008 0000 0000 0003 57b9 2000 0008
1250500  0000 c000 0003 57f8 2400 0001 0000 ae00 0003 581d a000 0018 0000 0044 0003 5837 a000 0001 0000 0048 0003 5844 8400 0000
1250560  0000 ae00 0000 0000 4400 0009 0000 ae00 0003 5855 4000 0018 0000 0019 0000 0000 4400 0009 0000 ae10 0003 5866 8000 0000
1250640  0000 0000 0003 5873 8000 0000 0000 0000 0000 0000 4400 000a 0000 ae10 0000 0000 4400 0008 0000 ae10 0000 0000 4400 0009
1250720  0000 ae20 0000 0000 4400 000a 0000 ae30 0003 587d 8000 0000 0000 0000 0003 58a0 2400 0001 0000 ae40 0003 58c6 a000 001c
1251000  0000 0044 0003 58d7 a000 0001 0000 0048 0003 58e4 8400 0000 0000 ae40 0000 0000 4400 001c 0000 ae40 0003 58f8 4000 001c
1251060  0000 0018 0000 0000 4400 001c 0000 ae50 0003 5909 8000 0000 0000 0000 0003 5916 8000 0000 0000 0000 0000 0000 4400 001d
1251140  0000 ae50 0000 0000 4400 001c 0000 ae50 0000 0000 4400 001d 0000 ae94 0003 5920 8000 0000 0000 0000 0003 5944 2400 0001
1251220  0000 aea4 0003 5973 a000 003c 0000 0044 0003 5984 a000 0001 0000 0048 0003 5991 8400 0000 0000 aea4 0000 0000 4400 002e
1251300  0000 aea4 0003 59a5 4000 003c 0000 0018 0000 0000 4400 002e 0000 aeb4 0003 59b6 8000 0000 0000 0000 0003 59c3 8000 0000
1251360  0000 0000 0000 0000 4400 002f 0000 aeb4 0000 0000 4400 002d 0000 aeb4 0003 59cd 8000 0000 0000 0000 0003 59fa 2400 0001
1251440  0000 aed8 0003 5a17 a000 000c 0000 0044 0003 5a28 a000 0001 0000 0048 0003 5a35 8400 0000 0000 aed8 0000 0000 4400 0012
1251520  0000 aed8 0003 5a69 4000 000c 0000 0018 0000 0000 4400 0012 0000 aee8 0003 5a7a 8000 0000 0000 0000 0003 5a87 8000 0000
1251600  0000 0000 0000 0000 4400 0013 0000 aee8 0000 0000 4400 0011 0000 aee8 0000 0000 4400 0012 0000 af0c 0000 0000 4400 0013
1251660  0000 af40 0003 5a91 8000 0000 0000 0000 0003 5aac 2400 0004 0000 af50 0003 5acc a000 0008 0000 0044 0003 5adc a000 0004
1251740  0000 0048 0003 5af6 8400 0000 0000 af50 0000 0000 4400 001b 0000 af50 0000 0000 4400 001b 0000 af64 0003 5b29 8000 0000
1252020  0000 0000 0003 5b36 8000 0000 0000 0000 0000 0000 4400 001c 0000 af64 0000 0000 4400 001a 0000 af64 0003 5b44 8000 0000
1252100  0000 0000 0003 5b62 2400 0004 0000 af40 0003 5b82 a000 0008 0000 0044 0003 5b92 a000 0004 0000 0048 0000 0000 4400 001a
1252160 .0000 af94 0003 5ba4 8000 0000 0000 0000 0003 5bb1 8000 0000 0000 0000 0000 0000 4400 001b 0000 af94 0000 0000 4400 0019
1252240  0000 af94 0003 5bbf 8000 0000 0000 0000 0003 5bdd 2400 0001 0000 afb0 0003 5bfa a000 0008 0000 0044 0003 5c0a a000 0001
1252320  0000 0048 0003 5c1b a000 0008 0000 004c 0000 0000 4400 0019 0000 afcc 0003 5c2c 8000 0000 0000 0000 0003 5c39 8000 0000
1252400  0000 0000 0000 0000 4400 001a 0000 afcc 0003 5c47 8000 0000 0000 0000 0000 0000 4400 001b 0000 afcc 0000 0000 4400 0018
1252460  0000 afcc 0003 5c55 8000 0000 0000 0000 0003 5c70 2400 0001 0000 afdc 0003 5c8d a000 0008 0000 0044 0003 5c9d a000 0001
1252540  0000 0048 0003 5cae a000 0004 0000 004c 0000 0000 4400 0018 0000 aff4 0003 5cbe 8000 0000 0000 0000 0003 5ccb 8000 0000
1252620  0000 0000 0000 0000 4400 0019 0000 aff4 0003 5cd9 8000 0000 0000 0000 0000 0000 4400 001a 0000 aff4 0000 0000 4400 0017
1252700  0000 aff4 0003 5ce7 8000 0000 0000 0000 0003 5d02 2400 0001 0000 b004 0003 5d20 a000 0008 0000 0044 0003 5d30 a000 0001
1252760  0000 0048 0003 5d41 a000 0001 0000 004c 0000 0000 4400 0017 0000 b01c 0003 5d52 8000 0000 0000 0000 0003 5d5f 8000 0000
1253040  0000 0000 0000 0000 4400 0018 0000 b01c 0003 5d6d 8000 0000 0000 0000 0000 0000 4400 0019 0000 b01c 0000 0000 4400 0016
1253120  0000 b01c 0003 5d7b 8000 0000 0000 0000 0003 5d97 2400 0001 0000 b02c 0003 5db5 a000 0008 0000 0044 0003 5dc5 a000 0001
1253200  0000 0048 0003 5dd6 a000 0004 0000 004c 0000 0000 4400 0016 0000 b044 0003 5de6 8000 0000 0000 0000 0003 5df3 8000 0000
1253260  0000 0000 0000 0000 4400 0017 0000 b044 0003 5e01 8000 0000 0000 0000 0000 0000 4400 0018 0000 b044 0000 0000 4400 0015
1253340  0000 b044 0003 5e0f 8000 0000 0000 0000 0003 5e2a 2400 0001 0000 b060 0003 5e46 a000 0008 0000 0044 0003 5e56 a000 0004
1253420  0000 0048 0000 0000 4400 0015 0000 b074 0003 5e66 8000 0000 0000 0000 0003 5e73 8000 0000 0000 0000 0000 0000 4400 0016
1253500  0000 b074 0800 0000 4400 0014 0000 b074 0003 5e81 8000 0000 0000 0000 0003 5e9a 2400 0004 0000 b090 0003 5ebb a000 0004
1253560  0000 0044 0003 5ecc a000 0004 0000 0048 0003 5ede 8400 0000 0000 b090 0000 0000 4400 0015 0000 b090 0000 0000 4400 0015
1253640  0000 b0a4 0003 5f10 8000 0000 0000 0000 0003 5f1d 8000 0000 0000 0000 0000 0000 4400 0016 0000 b0a4 0000 0000 4400 0014
1253720  0000 b0a4 0003 5f2b 8000 0000 0000 0000 0003 5f4a 0400 0000 0000 b0c0 0003 5f55 0400 0000 0000 b8a0 0003 5f7e 0400 0000
1254000  0000 b9ac 0003 5f95 0400 0000 0000 b9d8 0003 5fac c400 0000 0000 b83c 0003 5fcc 0400 0000 0000 ba5c 0003 5fe1 0400 0000
1254060  0000 b7fc 0003 6000 0400 0000 0000 b0c0 0003 6011 0400 0000 0000 ba00 0003 6029 0400 0000 0000 b678 0003 603d 0800 0000
1254140  0004 92c8 0003 604c 0400 0000 0000 b94c 0003 6066 0400 0000 0000 b97c 0003 6080 0400 0000 0000 b8d4 0003 6097 0400 0000
1254220  0000 b374 0003 60ab 0400 0000 0000 ba28 0003 60c2 0400 0000 0000 b224 0003 60d3 c400 0000 0000 ba8c 0003 60ee 0800 0000
1254300  0004 92cc 0003 60f7 6400 0000 0000 b0c0 0003 6127 6400 0000 0000 b0c0 0003 6132 8400 0000 0000 b0c0 0003 613f 8000 0000
1254360  0000 0000 0003 6169 8000 0000 0000 0000 0003 6183 8000 0000 0000 0000 0003 61ae 8000 0000 0000 0000 0003 61d0 8000 0000
1254440  0000 0000 0003 61f3 8000 0000 0000 0000 0003 6219 8000 0000 0000 0000 0003 623b 8000 0000 0000 0000 0003 625c 8000 0000
1254520  0000 0000 0003 6275 8000 0000 0000 0000 0003 6290 8000 0000 0000 0000 0003 62a4 8000 0000 0000 0000 0003 62b6 8000 0004
1254600  ffff fb05 0003 62d4 8000 0008 ffff fb05 0003 6311 8000 0001 ffff fb05 0003 632e 8000 0004 ffff fb05 0003 633c 2000 0004
1254660  0000 0000 0003 6349 2000 0004 0000 0000 0003 6359 2000 0001 0000 0000 0003 6378 2000 0004 0000 0000 0003 6383 2000 0004
1254740  0000 0000 0003 6390 2000 0004 0000 0000 0003 639d 2000 0001 0000 0000 0003 63ac 2000 0004 0000 0000 0003 63ba 2000 0004
1255020  0000 0000 0003 63c8 8000 0004 ffff fb05 0003 63d9 8000 0004 ffff fb05 0003 63e7 8000 0004 ffff fb05 0003 63f8 8000 0004
1255100  ffff fb05 0003 6409 8000 0004 ffff fb05 0003 6480 8000 0004 ffff fb05 0003 6518 8000 0004 ffff fb05 0003 655c 8000 0004
1255160  ffff fb05 0003 65dc 8000 0004 ffff fb05 0003 6656 8000 0004 ffff fb05 0003 6684 8000 003c ffff fb05 0003 679b 8000 003c
1255240  ffff fb05 0003 6897 2000 0004 0000 0000 0003 68ae 2000 0004 0000 0000 0003 68c7 2000 0004 0000 0000 0003 68df 2000 0004
1255320  0000 0000 0003 68f4 2000 0004 0000 0000 0003 690a 2000 0001 0000 0000 0003 6923 8000 0000 0000 0000 0003 69e9 8000 0000
1255400  0000 0000 0003 6aaf 8000 0000 0000 0000 0003 6b6f 8000 0000 0000 0000 0003 6bc3 8000 0028 ffff fb05 0003 6cdd 8000 0028
1255460  ffff fb05 0003 6d42 8000 0000 0000 0000 0003 6e0d 8000 0000 0000 0000 0003 6ed8 8000 0000 0000 0000 0003 6f96 8000 0000
```

| | | | | | | | | | | | | | | | | | | | | | | | | |
|---|---|---|---|---|---|---|---|---|---|---|---|---|---|---|---|---|---|---|---|---|---|---|---|---|
| 1255540 | 0000 | 0000 | 0003 | 705a | 8000 | 0000 | 0000 | 0000 | 0003 | 711f | 8000 | 0000 | 0000 | 0000 | 0003 | 717e | 8000 | 0048 | ffff | fb05 | 0003 | 71fc | 8000 | 0000 |
| 1255620 | 0000 | 0000 | 0003 | 72c0 | 8c00 | 0000 | 0000 | 0000 | 0003 | 738a | 9000 | 0000 | 0000 | 0000 | 0003 | 745f | 8000 | 0000 | 0000 | 0000 | 0003 | 752b | 8000 | 0000 |
| 1255700 | 0000 | 0000 | 0003 | 75c9 | 8000 | 0044 | ffff | fb05 | 0003 | 7620 | 8000 | 0000 | 0000 | 0000 | 0003 | 76e6 | 8000 | 0000 | 0000 | 0000 | 0003 | 77b1 | 8000 | 0000 |
| 1255760 | 0000 | 0000 | 0003 | 787e | 8000 | 0000 | 0000 | 0000 | 0003 | 78c0 | 2400 | 0044 | 0000 | b0c0 | 0003 | 78e0 | a000 | 0044 | 0000 | 0044 | 0003 | 78f0 | a000 | 0001 |
| 1256040 | 0000 | 0048 | 0003 | 78fc | 8400 | 0000 | 0000 | b0c0 | 0000 | 0000 | 4400 | 01d1 | 0000 | b0c0 | 0003 | 7919 | 4000 | 0044 | 0000 | 0018 | 0000 | 0000 | 4400 | 01d1 |
| 1256120 | 0000 | b0d0 | 0003 | 7929 | 8000 | 0000 | 0000 | 0000 | 0003 | 7936 | 8000 | 0000 | 0000 | 0000 | 0000 | 0000 | 4400 | 01d2 | 0000 | b0d0 | 0000 | 0000 | 4400 | 01d3 |
| 1256200 | 0000 | b104 | 0000 | 0000 | 4400 | 01d4 | 0000 | b1a8 | 0000 | 0000 | 4400 | 01d6 | 0000 | b1d8 | 0000 | 0000 | 4400 | 01d8 | 0000 | b208 | 0000 | 0000 | 4400 | 01d9 |
| 1256260 | 0000 | b214 | 0003 | 7940 | 8000 | 0000 | 0000 | 0000 | 0003 | 7955 | 8000 | 0050 | ffff | fb05 | 0003 | 79d0 | 8000 | 0000 | 0000 | 0000 | 0003 | 7a57 | 2000 | 0000 |
| 1256340 | 0000 | 0000 | 0003 | 7a79 | 2000 | 0000 | 0000 | 0000 | 0003 | 7a9c | 2000 | 0000 | 0000 | 0000 | 0003 | 7aa9 | 2000 | 0000 | 0000 | 0000 | 0003 | 7ab6 | 8000 | 0001 |
| 1256420 | ffff | fb05 | 0003 | 7afc | 2000 | 0004 | 0000 | 0000 | 0003 | 7b12 | 2000 | 0004 | 0000 | 0000 | 0003 | 7b34 | 8000 | 0000 | 0000 | 0000 | 0003 | 7bc1 | 2800 | 0001 |
| 1256500 | 0004 | 92c8 | 0003 | 7bd7 | 8000 | 0004 | ffff | fb05 | 0003 | 7be3 | 8000 | 0008 | ffff | fb05 | 0003 | 7c46 | 8000 | 0000 | 0000 | 0000 | 0003 | 7cc2 | 8000 | 0004 |
| 1256560 | ffff | fb05 | 0003 | 7cf7 | 8000 | 0000 | 0000 | 0000 | 0003 | 7d4b | 8000 | 0008 | ffff | fb05 | 0003 | 7db6 | 8000 | 0000 | 0000 | 0000 | 0003 | 7e1c | 8000 | 0004 |
| 1256640 | ffff | fb05 | 0003 | 7e51 | 8000 | 0000 | 0000 | 0000 | 0003 | 7ead | 8000 | 0008 | ffff | fb05 | 0003 | 7f10 | 8000 | 0000 | 0000 | 0000 | 0003 | 7f76 | 8000 | 0004 |
| 1256720 | ffff | fb05 | 0003 | 7fab | 8000 | 0000 | 0000 | 0000 | 0003 | 8007 | 8000 | 0008 | ffff | fb05 | 0003 | 8075 | 8000 | 0000 | 0000 | 0000 | 0003 | 8102 | 8000 | 0004 |
| 1257000 | ffff | fb05 | 0003 | 8139 | 8000 | 0000 | 0000 | 0000 | 0003 | 819b | 8000 | 0008 | ffff | fb05 | 0003 | 81f1 | 8000 | 0000 | 0000 | 0000 | 0003 | 8272 | 8000 | 0004 |
| 1257060 | ffff | fb05 | 0003 | 82a9 | 8000 | 0000 | 0000 | 0000 | 0003 | 8301 | 8000 | 0008 | ffff | fb05 | 0003 | 8357 | 8000 | 0000 | 0000 | 0000 | 0003 | 83c1 | 8000 | 0004 |
| 1257140 | ffff | fb05 | 0003 | 83f8 | 8000 | 0000 | 0000 | 0000 | 0003 | 8458 | 8000 | 0008 | ffff | fb05 | 0003 | 84ae | 8000 | 0000 | 0000 | 0000 | 0003 | 8518 | 8000 | 0004 |
| 1257220 | ffff | fb05 | 0003 | 854f | 8000 | 0000 | 0000 | 0000 | 0003 | 85af | 8000 | 0008 | ffff | fb05 | 0003 | 8608 | 8000 | 0000 | 0000 | 0000 | 0003 | 869a | 8000 | 0004 |
| 1257300 | ffff | fb05 | 0003 | 86d3 | 8000 | 0000 | 0000 | 0000 | 0003 | 8739 | 8000 | 0034 | ffff | fb05 | 0003 | 8852 | 8000 | 0034 | ffff | fb05 | 0003 | 8934 | 8000 | 0000 |
| 1257360 | 0000 | 0000 | 0003 | 89fe | 8000 | 0000 | 0000 | 0000 | 0003 | 8a2b | 8000 | 0040 | ffff | fb05 | 0003 | 8b43 | 8000 | 0040 | ffff | fb05 | 0003 | 8c5d | 2000 | 0004 |
| 1257440 | 0000 | 0000 | 0003 | 8c77 | 8000 | 0000 | 0000 | 0000 | 0003 | 8d44 | 8000 | 0000 | 0000 | 0000 | 0003 | 8def | 8000 | 0084 | ffff | fb05 | 0003 | 8e74 | 8000 | 0000 |
| 1257520 | 0000 | 0000 | 0003 | 8f49 | 8c00 | 0000 | 0000 | 0000 | 0003 | 8fc5 | 8000 | 0004 | ffff | fb05 | 0003 | 8fd9 | 2000 | 0001 | 0000 | 0000 | 0003 | 9005 | 2000 | 0001 |
| 1257600 | 0000 | 0000 | 0003 | 9030 | 2000 | 0001 | 0000 | 0000 | 0003 | 9048 | 2000 | 0001 | 0000 | 0000 | 0003 | 905e | 2000 | 0001 | 0000 | 0000 | 0003 | 9079 | 2000 | 0001 |
| 1257660 | 0000 | 0000 | 0003 | 9091 | 2000 | 0001 | 0000 | 0000 | 0003 | 90bb | 2000 | 0001 | 0000 | 0000 | 0003 | 90ca | 8400 | 0000 | 0000 | b224 | 0003 | 90dc | 8000 | 0004 |
| 1257740 | ffff | fb05 | 0003 | 9118 | 8000 | 0004 | ffff | fb05 | 0003 | 9159 | 8000 | 0004 | ffff | fb05 | 0003 | 9197 | 8000 | 0004 | ffff | fb05 | 0003 | 91d2 | 8000 | 0004 |
| 1260020 | ffff | fb05 | 0003 | 9210 | 8000 | 0004 | ffff | fb05 | 0003 | 9232 | 8000 | 0004 | ffff | fb05 | 0003 | 9254 | 8000 | 0004 | ffff | fb05 | 0003 | 9283 | 8000 | 0000 |
| 1260100 | 0000 | 0000 | 0003 | 9308 | 2000 | 0008 | 0000 | 0000 | 0003 | 932e | 8000 | 0008 | ffff | fb05 | 0003 | 9339 | 8000 | 0008 | ffff | fb05 | 0003 | 9345 | 8000 | 0008 |
| 1260160 | ffff | fb05 | 0003 | 9351 | 8000 | 0008 | ffff | fb05 | 0003 | 939d | 8000 | 0000 | 0000 | 0000 | 0003 | 9463 | 8000 | 0000 | 0000 | 0000 | 0003 | 94c5 | 8000 | 0044 |
| 1260240 | ffff | fb05 | 0003 | 9527 | 8000 | 0000 | 0000 | 0000 | 0003 | 95ed | 8000 | 0000 | 0000 | 0000 | 0003 | 9618 | 8000 | 0008 | ffff | fb05 | 0003 | 9624 | 8000 | 000c |
| 1260320 | ffff | fb05 | 0003 | 9697 | 9000 | 0000 | 0000 | 0000 | 0003 | 9723 | 8000 | 0008 | ffff | fb05 | 0003 | 9777 | 8000 | 0000 | 0000 | 0000 | 0003 | 97f7 | 8000 | 000c |
| 1260400 | ffff | fb05 | 0003 | 986d | 8000 | 0000 | 0000 | 0000 | 0003 | 9918 | 2000 | 0008 | 0000 | 0000 | 0003 | 9940 | 8000 | 000c | ffff | fb05 | 0003 | 99a4 | 8000 | 0000 |
| 1260460 | 0000 | 0000 | 0003 | 9a65 | 8000 | 0000 | 0000 | 0000 | 0003 | 9ad5 | 2000 | 0008 | 0000 | 0000 | 0003 | 9af9 | 8000 | 000c | ffff | fb05 | 0003 | 9b5e | 8000 | 0000 |
| 1260540 | 0000 | 0000 | 0003 | 9c2c | 8000 | 0000 | 0000 | 0000 | 0003 | 9c9a | 2300 | 0008 | 0000 | 0000 | 0003 | 9cbf | 8000 | 0008 | ffff | fb05 | 0003 | 9d20 | 8000 | 0000 |
| 1260620 | 0000 | 0000 | 0003 | 9dc7 | 8000 | 0010 | ffff | fb05 | 0003 | 9e57 | 8000 | 0000 | 0000 | 0000 | 0003 | 9f08 | 8000 | 0018 | ffff | fb05 | 0003 | 9f99 | 8000 | 0000 |
| 1260700 | 0000 | 0000 | 0003 | a068 | 8000 | 0000 | 0000 | 0000 | 0003 | a0f0 | 2000 | 0008 | 0000 | 0000 | 0003 | a116 | 8000 | 000c | ffff | fb05 | 0003 | a1a3 | 8000 | 0000 |
| 1260760 | 0000 | 0000 | 0003 | a272 | 8000 | 0000 | 0000 | 0000 | 0003 | a290 | 8000 | 0024 | ffff | fb05 | 0003 | a3dd | 8000 | 0000 | 0000 | 0000 | 0003 | a49d | 8000 | 0000 |
| 1261040 | 0000 | 0000 | 0003 | a531 | 8000 | 0004 | ffff | fb05 | 0003 | a57a | 8000 | 0000 | 0000 | 0000 | 0003 | a58d | 8000 | 0010 | ffff | fb05 | 0003 | a616 | 8000 | 0000 |
| 1261120 | 0000 | 0000 | 0003 | a6da | 8000 | 0000 | 0000 | 0000 | 0003 | a799 | 8000 | 0000 | 0000 | 0000 | 0003 | a7b0 | 2000 | 0008 | 0000 | 0000 | 0003 | a7d8 | 8000 | 003c |
| 1261200 | ffff | fb05 | 0003 | a8e1 | 8000 | 003c | ffff | fb05 | 0003 | a96e | 8000 | 0000 | 0000 | 0000 | 0003 | aa31 | 8000 | 0000 | 0000 | 0000 | 0003 | ab03 | 8000 | 0000 |
| 1261260 | 0000 | 0000 | 0003 | abce | 8000 | 0000 | 0000 | 0000 | 0003 | acaa | 8000 | 0000 | 0000 | 0000 | 0003 | ad84 | 8000 | 0000 | 0000 | 0000 | 0003 | ae4b | 8000 | 0000 |
| 1261340 | 0000 | 0000 | 0003 | ae99 | 2000 | 0008 | 0000 | 0000 | 0003 | aec2 | 8000 | 001c | ffff | fb05 | 0003 | af67 | 8000 | 0000 | 0000 | 0000 | 0003 | b03f | 8000 | 0000 |
| 1261420 | 0000 | 0000 | 0003 | b113 | 8000 | 0000 | 0000 | 0000 | 0003 | b1e9 | 8000 | 0000 | 0000 | 0000 | 0003 | b20c | 2000 | 0008 | 0000 | 0000 | 0003 | b23d | 8000 | 003c |
| 1261500 | ffff | fb05 | 0003 | b33f | 8000 | 003c | ffff | fb05 | 0003 | b3a4 | 8000 | 0000 | 0000 | 0000 | 0003 | b46a | 8000 | 0000 | 0000 | 0000 | 0003 | b527 | 8000 | 0000 |
| 1261560 | 0000 | 0000 | 0003 | b5ba | 2000 | 0008 | 0000 | 0000 | 0003 | b5e0 | 8000 | 0090 | ffff | fb05 | 0003 | b6dc | 8000 | 0090 | ffff | fb05 | 0003 | b7a2 | 8000 | 0000 |
| 1261640 | 0000 | 0000 | 0003 | b86f | 8000 | 0000 | 0000 | 0000 | 0003 | b93b | 8000 | 0000 | 0000 | 0000 | 0003 | ba0b | 8000 | 0000 | 0000 | 0000 | 0003 | baa7 | 2000 | 0008 |
| 1261720 | 0000 | 0000 | 0003 | bacc | 2400 | 003c | 0000 | b224 | 0003 | baee | a000 | 003c | 0000 | 0044 | 0003 | baff | 8400 | 0000 | 0000 | b224 | 0000 | 0000 | 4400 | 0010 |
| 1262000 | 0000 | b224 | 0003 | bb10 | 4000 | 003c | 0000 | 0018 | 0000 | 0000 | 4400 | 0010 | 0000 | b230 | 0003 | bb21 | 8000 | 0000 | 0000 | 0000 | 0000 | 0000 | 4400 | 000f |
| 1262060 | 0000 | b230 | 0000 | 0000 | 4400 | 0010 | 0000 | b338 | 0000 | 0000 | 4400 | 0011 | 0000 | b33c | 0000 | 0000 | 4400 | 0012 | 0000 | b340 | 0000 | 0000 | 4400 | 0010 |
| 1262140 | 0000 | b344 | 0000 | 0000 | 4400 | 0028 | 0000 | b358 | 0000 | 0000 | 4400 | 0029 | 0000 | b364 | 0003 | bb2e | 8000 | 0000 | 0000 | 0000 | 0003 | bb43 | 8000 | 0034 |
| 1262220 | ffff | fb05 | 0003 | bc95 | 8000 | 0000 | 0000 | 0000 | 0003 | bd56 | 8000 | 0000 | 0000 | 0000 | 0003 | be17 | 8000 | 0000 | 0000 | 0000 | 0003 | becf | 2000 | 0008 |
| 1262300 | 0000 | 0000 | 0003 | befa | 8000 | 0018 | ffff | fb05 | 0003 | bf8d | 8000 | 0000 | 0000 | 0000 | 0003 | c055 | 8000 | 0000 | 0000 | 0000 | 0003 | c08b | 2000 | 0008 |
| 1262360 | 0000 | 0000 | 0003 | c0b3 | 8000 | 002c | ffff | fb05 | 0003 | c168 | 8000 | 0000 | 0000 | 0000 | 0003 | c23b | 8000 | 0000 | 0000 | 0000 | 0003 | c2c7 | 2000 | 0008 |
| 1262440 | 0000 | 0000 | 0003 | c2f0 | 2000 | 000c | 0000 | 0000 | 0003 | c304 | 8400 | 0000 | 0000 | b374 | 0003 | c311 | 2800 | 0001 | 0004 | 92cc | 0003 | c321 | 2400 | 002c |
| 1262520 | 0000 | b374 | 0003 | c346 | a000 | 002c | 0000 | 0044 | 0003 | c357 | 8400 | 0000 | 0000 | b374 | 0000 | 0000 | 4400 | 0008 | 0000 | b374 | 0000 | 0000 | 4400 | 0008 |
| 1262600 | 0000 | b384 | 0003 | c36b | 8000 | 0000 | 0000 | 0000 | 0000 | 0000 | 4400 | 0007 | 0000 | b394 | 0000 | 0000 | 4400 | 0015 | 0000 | b548 | 0000 | 0000 | 4400 | 0016 |

| | | | | | | | | | | | | | | | | | | | | | | | | |
|---|---|---|---|---|---|---|---|---|---|---|---|---|---|---|---|---|---|---|---|---|---|---|---|---|
| 1262660 | 0000 | b554 | 0003 | c378 | 8000 | 0000 | 0000 | 0000 | 0003 | c390 | 2400 | 0004 | 0000 | b564 | 0003 | c39c | a000 | 0004 | 0000 | 0044 | 0003 | c3ab | a000 | 0001 |
| 1262740 | 0000 | 0048 | 0003 | c3bb | 8400 | 000c | 0000 | b564 | 0000 | 0000 | 4400 | 0023 | 0000 | b564 | 0000 | 0000 | 4400 | 0023 | 0000 | b578 | 0003 | c3c8 | 8000 | 0000 |
| 1263020 | 0000 | 0000 | 0003 | c3d5 | 8000 | 0000 | 0000 | 0000 | 0000 | 0000 | 4400 | 0024 | 0000 | b580 | 0003 | c3e2 | 8000 | 002c | ffff | ffd4 | 0000 | 0000 | c000 | 0004 |
| 1263100 | 0000 | 04d0 | 0003 | c3f0 | 8000 | 0000 | 0000 | 0000 | 0000 | 0000 | 4400 | 0027 | 0000 | b590 | 0000 | 0000 | 4400 | 0026 | 0000 | b590 | 0000 | 0000 | 4400 | 0027 |
| 1263160 | 0000 | b59c | 0000 | 0000 | 4400 | 0029 | 0000 | b5b0 | 0000 | 0000 | 4400 | 0029 | 0000 | b5bc | 0000 | 0000 | 4400 | 002a | 0000 | b5c8 | 0000 | 0000 | 4400 | 002c |
| 1263240 | 0000 | b5d4 | 0000 | 0000 | 4400 | 002d | 0000 | b5e0 | 0000 | 0000 | e000 | 0004 | 0000 | 055c | 0000 | 0000 | 4400 | 002f | 0000 | b61c | 0003 | c3fb | 2400 | 0001 |
| 1263320 | 0000 | b62c | 0003 | c40d | a000 | 0001 | 0000 | 0044 | 0000 | 0000 | 4400 | 0034 | 0000 | b62c | 0000 | 0000 | 4400 | 0034 | 0000 | b63c | 0003 | c41a | 8000 | 0000 |
| 1263400 | 0000 | 0000 | 0000 | 0000 | 4400 | 0035 | 0000 | b668 | 0003 | c424 | 2400 | 0001 | 0000 | b678 | 0003 | c43e | a000 | 0004 | 0000 | 0044 | 0003 | c44d | a000 | 0001 |
| 1263460 | 0000 | 0048 | 0000 | 0000 | 4400 | 003a | 0000 | b678 | 0000 | 0000 | 4400 | 003a | 0000 | b68c | 0003 | c45d | 8000 | 0000 | 0000 | 0000 | 0003 | c46a | 8000 | 0000 |
| 1263540 | 0000 | 0000 | 0000 | 0000 | 4400 | 003b | 0000 | b68c | 0000 | 0000 | 4400 | 003c | 0000 | b69c | 0000 | 0000 | 4400 | 003e | 0000 | b6bc | 0000 | 0000 | 4400 | 003f |
| 1263620 | 0000 | b6d4 | 0000 | 0000 | 4400 | 0042 | 0000 | b6e0 | 0000 | 0000 | 4400 | 0043 | 0000 | b6f0 | 0000 | 0000 | 4400 | 0045 | 0000 | b710 | 0000 | 0000 | 4400 | 0046 |
| 1263700 | 0000 | b728 | 0003 | c477 | 8000 | 0000 | 0000 | 0000 | 0003 | c48f | 2400 | 0001 | 0000 | b738 | 0003 | c4bc | 8400 | 0000 | 0000 | b738 | 0000 | 0000 | 4400 | 023b |
| 1263760 | 0000 | b738 | 0000 | 0000 | 4400 | 023b | 0000 | b744 | 0003 | c4d9 | 4000 | 000c | 0000 | 001d | 0000 | 0000 | c000 | 0002 | 0000 | 0684 | 0003 | c4f5 | 8000 | 0000 |
| 1264040 | 0000 | 0000 | 0000 | 0000 | 4400 | 023c | 0000 | b744 | 0000 | 0000 | 4400 | 023b | 0000 | b744 | 0003 | c50d | 8400 | 0000 | 0000 | b754 | 0000 | 0000 | 4400 | 001a |
| 1264120 | 0000 | b754 | 0000 | 0000 | 4400 | 001e | 0000 | b7a8 | 0000 | 0000 | e000 | 0002 | 0000 | 06fc | 0000 | 0000 | 4400 | 001f | 0000 | b7bc | 0003 | c51a | 2400 | 0001 |
| 1264200 | 0000 | b7cc | 0003 | c547 | 8400 | 0000 | 0000 | b7cc | 0000 | 0000 | 4400 | 023b | 0000 | b7cc | 0000 | 0000 | 4400 | 023b | 0000 | b7d8 | 0000 | 0000 | 4400 | 023c |
| 1264260 | 0000 | b7ec | 0003 | c564 | 2000 | 0008 | 0000 | 0000 | 0003 | c5aa | 2000 | 0008 | 0000 | 0000 | 0003 | c5e6 | 2400 | 0001 | 0000 | b7fc | 0003 | c60b | a000 | 0018 |
| 1264340 | 0000 | 0044 | 0003 | c625 | a000 | 0001 | 0000 | 0048 | 0003 | c632 | 8400 | 0000 | 0000 | b7fc | 0000 | 0000 | 4400 | 0009 | 0000 | b7fc | 0003 | c643 | 4000 | 0018 |
| 1264420 | 0000 | 0018 | 0000 | 0000 | 4400 | 0009 | 0000 | b80c | 0003 | c654 | 8000 | 0000 | 0000 | 0000 | 0003 | c661 | 8000 | 0000 | 0000 | 0000 | 0000 | 0000 | 4400 | 000a |
| 1264500 | 0000 | b80c | 0000 | 0000 | 4400 | 0008 | 0000 | b80c | 0000 | 0000 | 4400 | 0009 | 0000 | b81c | 0000 | 0000 | 4400 | 000a | 0000 | b82c | 0003 | c66b | 8000 | 0000 |
| 1264560 | 0000 | 0000 | 0003 | c68e | 2400 | 0001 | 0000 | b83c | 0003 | c6b4 | a000 | 001c | 0000 | 0044 | 0003 | c6ce | a000 | 0001 | 0000 | 0048 | 0003 | c6db | 8400 | 0000 |
| 1264640 | 0000 | b83c | 0000 | 0000 | 4400 | 001c | 0000 | b83c | 0003 | c6ef | 4000 | 001c | 0000 | c018 | 0000 | 0000 | 4400 | 001c | 0000 | b84c | 0003 | c700 | 8000 | 0000 |
| 1264720 | 0000 | 0000 | 0003 | c70d | 8000 | 0000 | 0000 | 0000 | 0000 | 0000 | 4400 | 001d | 0000 | b84c | 0000 | 0000 | 4400 | 001c | 0000 | b84c | 0000 | 0000 | 4400 | 001d |
| 1265000 | 0000 | b890 | 0003 | c717 | 8000 | 0000 | 0000 | 0000 | 0003 | c73b | 2400 | 0001 | 0000 | b8a0 | 0003 | c76a | a000 | 003c | 0000 | 0044 | 0003 | c77b | a000 | 0001 |
| 1265060 | 0000 | 0048 | 0003 | c788 | 8400 | 0000 | 0000 | b8a0 | 0000 | 0000 | 4400 | 002e | 0000 | b8a0 | 0003 | c79c | 4000 | 003c | 0000 | 0018 | 0000 | 0000 | 4400 | 002e |
| 1265140 | 0000 | b8b0 | 0003 | c7ad | 9000 | 0000 | 0000 | 0000 | 0003 | c7ba | 8000 | 0000 | 0000 | 0000 | 0000 | 0000 | 4400 | 002f | 0000 | b8b0 | 0000 | 0000 | 4400 | 002d |
| 1265220 | 0000 | b8b0 | 0003 | c7c4 | 8000 | 0000 | 0000 | 0000 | 0003 | c7f1 | 2400 | 0001 | 0000 | b8d4 | 0003 | c80e | a000 | 000c | 0000 | 0044 | 0003 | c827 | a000 | 0001 |
| 1265300 | 0000 | 0048 | 0003 | c834 | 8400 | 0000 | 0000 | b8d4 | 0000 | 0000 | 4400 | 0012 | 0000 | b8d4 | 0003 | c868 | 4000 | 000c | 0000 | 0018 | 0000 | 0000 | 4400 | 0012 |
| 1265360 | 0000 | b8e4 | 0003 | c879 | 8000 | 0000 | 0000 | 0000 | 0003 | c886 | 8000 | 0000 | 0000 | 0000 | 0000 | 0000 | 4400 | 0013 | 0000 | b8e4 | 0000 | 0000 | 4400 | 0011 |
| 1265440 | 0000 | b8e4 | 0000 | 0000 | 4400 | 0012 | 0000 | b908 | 0000 | 0000 | 4400 | 0013 | 0000 | b93c | 0003 | c890 | 8000 | 0000 | 0000 | 0000 | 0003 | c8ab | 2400 | 0004 |
| 1265520 | 0000 | b94c | 0003 | c8cb | a000 | 0008 | 0000 | 0044 | 0003 | c8db | a000 | 0004 | 0000 | 0048 | 0003 | c8f5 | 8400 | 0000 | 0000 | b94c | 0000 | 0000 | 4400 | 001b |
| 1265600 | 0000 | b94c | 0000 | 0000 | 4400 | 001b | 0000 | b960 | 0003 | c928 | 8000 | 0000 | 0000 | 0000 | 0003 | c935 | 8000 | 0000 | 0000 | 0000 | 0000 | 0000 | 4400 | 001c |
| 1265660 | 0000 | b960 | 0000 | 0000 | 4400 | 001a | 0000 | b960 | 0003 | c943 | 8000 | 0000 | 0000 | 0000 | 0003 | c961 | 2400 | 0004 | 0000 | b97c | 0003 | c981 | a000 | 0008 |
| 1265740 | 0000 | 0044 | 0003 | c991 | a000 | 0004 | 0000 | 0048 | 0000 | 0000 | 4400 | 001a | 0000 | b990 | 0003 | c9a3 | 8000 | 0000 | 0000 | 0000 | 0003 | c9b0 | 8000 | 0000 |
| 1266020 | 0000 | 0000 | 0000 | 0000 | 4400 | 001b | 0000 | b990 | 0000 | 0000 | 4400 | 0019 | 0000 | b990 | 0003 | c9be | 8000 | 0000 | 0000 | 0000 | 0003 | c9dc | 2400 | 0001 |
| 1266100 | 0000 | b9ac | 0003 | c9f9 | a000 | 0008 | 0000 | 0044 | 0003 | ca09 | a000 | 0001 | 0000 | 0048 | 0003 | ca1a | a000 | 0008 | 0000 | 004c | 0000 | 0000 | 4400 | 0019 |
| 1266160 | 0000 | b9c8 | 0003 | ca2b | 8000 | 0000 | 0000 | 0000 | 0003 | ca38 | 8000 | 0000 | 0000 | 0000 | 0000 | 0000 | 4400 | 001a | 0000 | b9c8 | 0003 | ca46 | 8000 | 0000 |
| 1266240 | 0000 | 0000 | 0000 | 0000 | 4400 | 001b | 0000 | b9c8 | 0000 | 0000 | 4400 | 0018 | 0000 | b9c8 | 0003 | ca54 | 8000 | 0000 | 0000 | 0000 | 0003 | ca6f | 2400 | 0001 |
| 1266320 | 0000 | b9d8 | 0003 | ca8c | a000 | 0008 | 0000 | 0044 | 0003 | ca9c | a000 | 0001 | 0000 | 0048 | 0003 | caad | a000 | 0004 | 0000 | 004c | 0000 | 0000 | 4400 | 0018 |
| 1266400 | 0000 | b9f0 | 0003 | cabd | 8000 | 0000 | 0000 | 0000 | 0003 | caca | 8000 | 0000 | 0000 | 0000 | 0000 | 0000 | 4400 | 0019 | 0000 | b9f0 | 0003 | cad8 | 8000 | 0000 |
| 1266460 | 0000 | 0000 | 0000 | 0000 | 4400 | 001a | 0000 | b9f0 | 0000 | 0000 | 4400 | 0017 | 0000 | b9f0 | 0003 | cae6 | 8000 | 0000 | 0000 | 0000 | 0003 | cb01 | 2400 | 0001 |
| 1266540 | 0000 | ba00 | 0003 | cb1f | a000 | 0008 | 0000 | 0044 | 0003 | cb2f | a000 | 0001 | 0000 | 0048 | 0003 | cb40 | a000 | 0001 | 0000 | 004c | 0000 | 0000 | 4400 | 0017 |
| 1266620 | 0000 | ba18 | 0003 | cb51 | 8000 | 0000 | 0000 | 0000 | 0003 | cb5e | 8000 | 0000 | 0000 | 0000 | 0000 | 0000 | 4400 | 0018 | 0000 | ba18 | 0003 | cb6c | 8000 | 0000 |
| 1266700 | 0000 | 0000 | 0000 | 0000 | 4400 | 0019 | 0000 | ba18 | 0000 | 0000 | 4400 | 0016 | 0000 | ba18 | 0003 | cb7a | 8000 | 0000 | 0000 | 0000 | 0003 | cb96 | 2400 | 0001 |
| 1266760 | 0000 | ba28 | 0003 | cbb4 | a000 | 0008 | 0000 | 0044 | 0003 | cbc4 | a000 | 0001 | 0000 | 0048 | 0003 | cbd5 | a000 | 0004 | 0000 | 004c | 0000 | 0000 | 4400 | 0016 |
| 1267040 | 0000 | ba40 | 0003 | cbe5 | 8000 | 0000 | 0000 | 0000 | 0003 | cbf2 | 8000 | 0000 | 0000 | 0000 | 0000 | 0000 | 4400 | 0017 | 0000 | ba40 | 0003 | cc00 | 8000 | 0000 |
| 1267120 | 0000 | 0000 | 0000 | 0000 | 4400 | 0018 | 0000 | ba40 | 0000 | 0000 | 4400 | 0015 | 0000 | ba40 | 0003 | cc0e | 8000 | 0000 | 0000 | 0000 | 0003 | cc29 | 2400 | 0001 |
| 1267200 | 0000 | ba5c | 0003 | cc45 | a000 | 0008 | 0000 | 0044 | 0003 | cc55 | a000 | 0004 | 0000 | 0048 | 0000 | 0000 | 4400 | 0015 | 0000 | ba70 | 0003 | cc65 | 8000 | 0000 |
| 1267260 | 0000 | 0000 | 0003 | cc72 | 8000 | 0000 | 0000 | 0000 | 0000 | 0000 | 4400 | 0016 | 0000 | ba70 | 0000 | 0000 | 4400 | 0014 | 0000 | ba70 | 0003 | cc80 | 8000 | 0000 |
| 1267340 | 0000 | 0000 | 0003 | cc99 | 2400 | 0004 | 0000 | ba8c | 0003 | ccba | a000 | 0004 | 0000 | 0044 | 0003 | cccb | a000 | 0004 | 0000 | 0048 | 0003 | ccdd | 8400 | 0000 |
| 1267420 | 0000 | ba8c | 0000 | 0000 | 4400 | 0015 | 0000 | ba8c | 0000 | 0000 | 4400 | 0015 | 0000 | baa0 | 0003 | cd0f | 8000 | 0000 | 0000 | 0000 | 0003 | cd1c | 8000 | 0000 |
| 1267500 | 0000 | 0000 | 0000 | 0000 | 4400 | 0016 | 0000 | baa0 | 0000 | 0000 | 4400 | 0014 | 0000 | baa0 | 0003 | cd2a | 8000 | 0000 | 0000 | 0000 | 0003 | cd49 | 0400 | 0000 |
| 1267560 | 0000 | bac0 | 0003 | cd55 | 0600 | 0000 | 0003 | d9b0 | 0003 | cd5f | 0600 | 0000 | 0003 | d96c | 0003 | cd66 | 0600 | 0000 | 0003 | d92c | 0003 | cd71 | 0600 | 0000 |
| 1267640 | 0003 | d8f0 | 0003 | cd7c | 6400 | 0000 | 0000 | bac0 | 0003 | cda2 | 6400 | 0000 | 0000 | bac0 | 0003 | cdae | 8000 | 0000 | 0000 | 0000 | 0003 | cdd8 | 8000 | 0000 |
| 1267720 | 0000 | 0000 | 0003 | cdf2 | 8000 | 0000 | 0000 | 0000 | 0003 | ce1d | 8000 | 0000 | 0000 | 0000 | 0003 | ce3f | 8000 | 0000 | 0000 | 0000 | 0003 | ce62 | 8000 | 0000 |

```
1270000 0000 0000 0003 ce88 8000 0000 0000 0000 0003 ceaa 8000 0000 0000 0000 0003 cecb 8000 0000 0000 0000 0003 cee4 8000 0000
1270060 0000 0000 0003 ceff 8000 0000 0000 0000 0003 cf13 8000 0000 0000 0000 0003 cf25 8200 0000 0000 0ff2 0003 cf3a 8000 0014
1270140 ffff fb05 0000 0000 a200 0000 0000 0000 0003 cfc0 8200 0000 0000 0000 0000 0000 a200 0000 0000 0000 0003 cfd6 8200 0000
1270220 0000 0000 0000 0000 a200 0000 0000 0000 0003 cfed 8200 0000 0000 0000 0000 0000 a200 0000 0000 0000 0003 d002 2000 0001
1270300 0000 0000 0003 d018 2000 0001 0000 0000 0003 d026 2000 0001 0000 0000 0003 d04e 2000 0001 0000 0000 0003 d06e 2000 0001
1270360 0000 0000 0003 d08d 2000 0001 0000 0000 0003 d09b 2000 0001 0000 0000 0003 d0a8 2400 0000 0000 bac0 0003 d0b7 a000 0004
1270440 0000 0044 0003 d0c0 a000 0001 0000 0048 0003 d0c9 a000 0001 0000 004c 0003 d0d6 a000 0004 0000 0050 0003 d0e0 a000 0004
1270520 0000 0054 0003 d0ea a000 0004 0000 0058 0003 d0f4 a000 0004 0000 005c 0003 d0fe a000 0004 0000 0060 0003 d108 a000 0004
1270600 0000 0064 0003 d112 a000 0004 0000 0068 0003 d11c a000 0004 0000 006c 0003 d126 a000 0004 0000 0070 0003 d130 a000 0004
1270660 0000 0074 0000 0000 4400 0015 0000 bac0 0000 0000 4400 0015 0000 bae4 0000 0000 4400 0016 0000 bae4 0000 0000 4400 0017
1270740 0000 bb38 0000 0000 4400 0018 0000 bb58 0003 d13a 2400 0001 0000 bb60 0003 d14b a000 0001 0000 0044 0000 0000 4400 001d
1271020 0000 bb60 0000 0000 4400 001d 0000 bb70 0003 d155 8000 0001 ffff fffc 0000 0000 4400 001e 0000 bb70 0003 d15e 8000 0001
1271100 ffff fffb 0000 0000 c000 0002 0000 00b8 0000 0000 4400 0021 0000 bb78 0000 0000 4400 0022 0000 bb90 0000 0000 4400 0023
1271160 0000 bbec 0000 0000 4400 0025 0000 bc00 0000 0000 e000 0002 0000 014c 0000 0000 4400 0026 0000 bc0c 0003 d166 2400 0001
1271240 0000 bc1c 0003 d177 a000 0001 0000 0044 0000 0000 4400 002c 0000 bc1c 0000 0000 4400 002c 0000 bc2c 0003 d181 8000 0001
1271320 ffff fffc 0000 0000 4400 002d 0000 bc2c 0003 d18a 8000 0001 ffff fffb 0000 0000 c000 0002 0000 0174 0000 0000 4400 0030
1271400 0000 bc34 0000 0000 4400 0031 0000 bc4c 0000 0000 4400 0032 0000 bca8 0000 0000 4400 0034 0000 bcbc 0000 0000 e000 0002
1271460 0000 0208 0000 0000 4400 0035 0000 bcc8 0003 d192 2400 0001 0000 bcd8 0003 d1a1 a000 0001 0000 0044 0003 d1ae a000 0004
1271540 0000 0048 0003 d1b8 a000 0004 0000 004c 0003 d1c2 a000 0004 0000 0050 0003 d1cc a000 0004 0000 0054 0003 d1d6 a000 0004
1271620 0000 0058 0003 d1e0 a000 0004 0000 005c 0003 d1ea a000 0004 0000 0060 0003 d1f4 a000 0004 0000 0064 0003 d1fe a000 0004
1271700 0000 0068 0003 d208 a000 0004 0000 006c 0000 0000 4400 0039 0000 bcd8 0000 0000 4400 0039 0000 bcfc 0000 0000 4400 003a
1271760 0000 bcfc 0000 0000 4400 003b 0000 bd50 0000 0000 4400 003c 0000 bd60 0003 d212 8200 0000 0000 19ec 0003 d244 8400 0000
1272040 0000 bd70 0003 d276 2600 0001 0003 d8f0 0003 d29a 8200 0000 0000 2807 0003 d2cc 8400 0000 0000 bd70 0003 d2fe 2600 0001
1272120 0003 d92c 0003 d322 8200 0000 0000 2bab 0003 d34f 8400 0000 0000 bd70 0003 d37c 2600 0001 0003 d96c 0003 d39c 8000 0001
1272200 ffff fb05 0003 d41e 8000 0004 ffff fb05 0003 d42d 8000 0004 ffff fb05 0003 d45d 8000 0004 ffff fb05 0000 0000 a200 0000
1272260 0000 0000 0003 d47d 2000 0004 0000 0000 0003 d492 2000 0004 0000 0000 0003 d4a2 2000 0004 0000 0000 0000 0000 a200 0000
1272340 0000 0000 0003 d4c1 8200 0000 0000 07e7 0003 d4e4 8000 0004 ffff fb05 0000 0000 a200 0000 0000 0000 0003 d513 8000 0004
1272420 ffff fb05 0000 0000 a200 0000 0000 0000 0003 d525 8200 0000 0000 0000 0000 0000 a200 0000 0000 0000 0003 d557 8200 0000
1272500 0000 1c29 0003 d588 8400 0000 0000 bd70 0003 d5b9 2600 0001 0003 d9b0 0003 d5dd 8000 0001 ffff fb05 0003 d5ed 2000 0004
1272560 0000 0000 0000 0000 a200 0000 0000 0000 0003 d5fe 2400 0004 0000 bd70 0003 d60c a000 0001 0000 0044 0003 d616 a000 0001
1272640 0000 0048 0003 d622 a000 0001 0000 004c 0003 d630 a000 0001 0000 0050 0003 d63d 8400 0000 0000 bd70 0000 0000 4400 0048
1272720 0000 bd70 0000 0000 4400 0048 0000 bd8c 0003 d649 8000 0001 ffff fffc 0003 d655 8000 0004 ffff fff8 0003 d664 8000 0004
1273000 ffff fff4 0000 0000 4400 004b 0000 bd8c 0003 d670 8000 0004 ffff fff0 0000 0000 4400 004c 0000 bd90 0000 0000 c000 0002
1273060 0000 02dc 0000 0000 4400 004f 0000 bd9c 0000 0000 4400 0050 0000 bdb0 0000 0000 4400 0052 0000 bdc4 0000 0000 4400 0053
1273140 0000 bdf4 0000 0000 4400 0054 0000 be08 0000 0000 4400 0055 0000 be20 0000 0000 4400 0056 0000 be38 0000 0000 4400 0057
1273220 0000 be54 0000 0000 4400 0059 0000 be5c 0000 0000 4400 005a 0000 be6c 0000 0000 4400 005b 0000 be7c 0000 0000 4400 005e
1273300 0000 be98 0000 0000 4400 005f 0000 bea8 0000 0000 4400 0061 0000 bebc 0000 0000 4400 0064 0000 bec4 0000 0000 4400 0065
1273360 0000 becc 0000 0000 4400 0057 0000 bed4 0000 0000 4400 0068 0000 bef4 0000 0000 e000 0002 0000 0440 0000 0000 4400 0069
1273440 0000 bf00 0003 d682 2400 0001 0000 bf10 0003 d690 a000 0004 0000 0044 0000 0000 4400 006e 0000 bf10 0000 0000 4400 006e
1273520 0000 bf20 0000 0000 4400 006f 0000 bf20 0000 0000 4400 0070 0000 bf30 0000 0000 4400 0071 0000 bf40 0000 0000 4400 0072
1273600 0000 bf50 0000 0000 4400 0074 0000 bf60 0000 0000 4400 0075 0000 bf70 0003 d69d 0400 0000 0000 bf80 0003 d6aa 0400 0000
1273660 0000 c360 0003 d6c1 0400 0000 0000 c38c 0003 d6d8 0400 0000 0000 c410 0003 d6ed 0400 0000 0000 bf80 0003 d6fe 0400 0000
1273740 0000 c3b4 0003 d716 0400 0000 0000 c440 0003 d72c 0800 0000 0004 92d0 0003 d73b 0400 0000 0000 c300 0003 d755 0400 0000
1274020 0000 c330 0003 d76f 0400 0000 0000 c3dc 0003 d786 0400 0000 0000 c4a0 0003 d7a1 6400 0000 0000 bf80 0003 d7cf 6400 0000
1274100 0000 bf80 0003 d7dc 8400 0000 0000 bf80 0003 d7eb 8000 0000 0000 0000 0003 d815 8000 0000 0000 0000 0003 d82f 8000 0000
1274160 0000 0000 0003 d85a 8000 0000 0000 0000 0003 d87c 8000 0000 0000 0000 0003 d89f 8000 0000 0000 0000 0003 d8c5 8000 0000
1274240 0000 0000 0003 d8e7 8000 0000 0000 0000 0003 d908 8000 0000 0000 0000 0003 d921 8000 0000 0000 0000 0003 d93c 8000 0000
1274320 0000 0000 0003 d950 8000 0000 0000 0000 0003 d962 8000 0004 ffff fb05 0003 d980 8000 0008 ffff fb05 0003 d9bd 8000 0001
1274400 ffff fb05 0003 d9da 8000 0004 ffff fb05 0003 d9e8 8000 0004 ffff fb05 0003 d9f9 8000 0004 ffff fb05 0003 da0a 8000 0004
1274460 ffff fb05 0003 da81 8000 0004 ffff fb05 0003 db19 8000 0004 ffff fb05 0003 db5d 8000 0004 ffff fb05 0003 dbdd 8000 0004
1274540 ffff fb05 0003 dc57 8000 0004 ffff fb05 0003 dc85 8000 003c ffff fb05 0003 dd9c 8000 003c ffff fb05 0003 de98 2000 0004
1274620 0000 0000 0003 deaf 2000 0004 0000 0000 0003 dec8 2000 0004 0000 0000 0003 dee0 2000 0004 0000 0000 0003 def5 2000 0004
1274700 0000 0000 0003 df0b 2000 0001 0000 0000 0003 df24 8000 0000 0000 0000 0003 dfea 8000 0000 0000 0000 0003 e0b0 8000 0000
1274760 0000 0000 0003 e170 8000 0000 0000 0000 0003 e1c4 8000 0028 ffff fb05 0003 e2e5 8000 0028 ffff fb05 0003 e34a 8000 0000
1275040 0000 0000 0003 e415 8000 0000 0000 0000 0003 e4e0 8000 0000 0000 0000 0003 e59e 8000 0000 0000 0000 0003 e662 8000 0000
```

```
1275120  0000 0000 0003 e727 8000 0000 0000 0000 0003 e786 8000 0048 ffff fb05 0003 e804 8000 0000 0000 0000 0003 e8c8 8000 0000
1275200  0000 0000 0003 e992 8000 0000 0000 0000 0003 ea67 8000 0000 0000 0000 0003 eb33 8000 0000 0000 0000 0003 ebd1 8000 0044
1275260  ffff fb05 0003 ec28 800c 0000 0000 0000 0003 ecee 8000 0000 0000 0000 0003 edb9 8000 0000 0000 0000 0003 ee86 8000 0000
1275340  0000 0000 0003 eec8 2400 0044 0000 bf80 0003 eee8 a000 0044 0000 0044 0003 eef8 a000 0001 0000 0048 0003 ef04 8400 0000
1275420  0000 bf80 0003 0000 4400 01d1 0000 bf80 0003 ef21 4000 0044 0000 0018 0000 0000 4400 01d1 0000 bf90 0003 ef31 8000 0000
1275500  0000 0000 0003 ef3e 8000 0000 0000 0000 0000 0000 4400 01d2 0000 bf90 0000 0000 4400 01d3 0000 bfc4 0000 0000 4400 01d4
1275560  0000 c068 0000 0000 4400 01d6 0000 c098 0000 0000 4400 01d8 0000 c0c8 0000 0000 4400 01d9 0000 c0d4 0003 ef48 8000 0000
1275640  0000 0000 0003 ef5d 8000 0050 ffff fb05 0003 efd8 8000 0000 0000 0000 0003 f05f 2000 0000 0000 0000 0003 f081 2000 0000
1275720  0000 0000 0003 f0a4 2000 0000 0000 0000 0003 f0b1 2000 0000 0000 0000 0003 f0be 8000 0001 ffff fb05 0003 f0f8 2000 0004
1276000  0000 0000 0003 f11a 2000 0004 0000 0000 0003 f13c 8000 0000 0000 0000 0003 f1c9 2800 0001 0004 92d0 0003 f1df 8000 0004
1276060  ffff fb05 0003 f1eb 8000 0008 ffff fb05 0003 f24e 8000 0000 0000 0000 0003 f2ca 8000 0004 ffff fb05 0003 f2ff 8000 0000
1276140  0000 0000 0003 f353 8000 0008 ffff fb05 0003 f3be 8000 0000 0000 0000 0003 f424 8000 0004 ffff fb05 0003 f459 8000 0000
1276220  0000 0000 0003 f4b5 8000 0008 ffff fb05 0003 f518 8000 0000 0000 0000 0003 f57e 8000 0004 ffff fb05 0003 f5b3 8000 0000
1276300  0000 0000 0003 f60f 8000 0008 ffff fb05 0003 f67d 8000 0000 0000 0000 0003 f70a 8000 0004 ffff fb05 0003 f741 8000 0000
1276360  0000 0000 0003 f7a3 8000 0008 ffff fb05 0003 f7f9 8000 0000 0000 0000 0003 f87a 8000 0004 ffff fb05 0003 f8b1 8000 0000
1276440  0000 0000 0003 f909 8000 0008 ffff fb05 0003 f95f 8000 0000 0000 0000 0003 f9c9 8000 0004 ffff fb05 0003 fa00 8000 0000
1276520  0000 0000 0003 fa60 8000 0008 ffff fb05 0003 fab6 8000 0000 0000 0000 0003 fb20 8000 0004 ffff fb05 0003 fb57 8000 0000
1276600  0000 0000 0003 fbb7 8000 0008 ffff fb05 0003 fc10 8000 0000 0000 0000 0003 fca2 8000 0004 ffff fb05 0003 fcdb 8000 0000
1276660  0000 0000 0003 fd41 2000 0004 0000 0000 0003 fd4e 2000 0004 0000 0000 0003 fd5e 8000 0034 ffff fb05 0003 fe77 8000 0034
1276740  ffff fb05 0003 ff59 8000 0000 0000 0000 0004 0023 8000 0000 0000 0000 0004 0050 8000 0040 ffff fb05 0004 0168 8000 0040
1277020  ffff fb05 0004 0292 2000 0004 0000 0000 0004 029c 8000 0000 0000 0000 0004 0369 8000 0000 0000 0000 0004 0414 8000 0084
1277100  ffff fb05 0004 0499 8000 0000 0000 0000 0004 056e 8000 0000 0000 0000 0004 05ea 8000 0004 ffff fb05 0004 05fe 8000 0004
1277160  ffff fb05 0004 062d 8000 0000 0000 0000 0004 06b2 2000 0008 0000 0000 0004 06da 8000 0008 ffff fb05 0004 06e5 8000 0008
1277240  ffff fb05 0004 06f1 8000 0008 ffff fb05 0004 06fd 8000 0008 ffff fb05 0004 0749 8000 0000 0000 0000 0004 080f 8000 0000
1277320  0000 0000 0004 0871 8000 0044 ffff fb05 0004 08d3 8000 0000 0000 0000 0004 0999 8000 0000 0000 0000 0004 09c4 8000 0008
1277400  ffff fb05 0004 09d0 2000 0008 0000 0000 0004 09f9 2400 0008 0000 c0e4 0004 0a1b a000 0008 0000 0044 0004 0a2b a000 0001
1277460  0000 0048 0004 0a38 8400 0000 0000 c0e4 0000 0000 4400 000f 0000 c0e4 0004 0a47 4000 0008 0000 0018 0000 0000 4400 000f
1277540  0000 c0f4 0004 0a57 8000 0000 0000 0000 0004 0a64 8000 0000 0000 0000 0000 0000 4400 0010 0000 c0f4 0000 0000 4400 000f
1277620  0000 c0f4 0000 0000 4400 0011 0000 c164 0000 0000 4400 0012 0000 c174 0000 0000 4400 0013 0000 c19c 0000 0000 4400 0015
1277700  0000 c1b4 0000 0000 4400 0018 0000 c1d4 0000 0000 4400 0019 0000 c1d8 0000 0000 4400 001a 0000 c1e4 0004 0a6e 8000 0000
1277760  0000 0000 0004 0a85 2400 0001 0000 c1f4 0004 0aa1 a000 0008 0000 0044 0004 0ab1 a000 0001 0000 0048 0000 0000 4400 001d
1300040  0000 c1f4 0004 0abe 4000 0008 0000 0018 0000 0000 4400 001d 0000 c204 0004 0ace 8000 0000 0000 0000 0004 0adb 8000 0000
1300120  0000 0000 0000 0000 4400 001e 0000 c204 0000 0000 4400 001f 0000 c214 0000 0000 4400 0021 0000 c220 0000 0000 4400 0022
1300200  0000 c230 0000 0000 4400 0023 0000 c258 0000 0000 4400 0025 0000 c270 0000 0000 4400 0028 0000 c290 0000 0000 4400 0029
1300260  0000 c294 0004 0ae5 8000 0000 0000 0000 0004 0aff 2400 0001 0000 c2a4 0004 0b22 8400 0000 0000 c2a4 0000 0000 4400 023b
1300340  0000 c2a4 0000 0000 4400 023b 0000 c2b0 0000 0000 4400 023c 0000 c2c0 0004 0b3f 2400 0001 0000 c2d0 0000 0000 4400 023b
1300420  0000 c2d0 0000 0000 4400 023b 0000 c2dc 0000 0000 4400 023c 0000 c2f0 0004 0b62 2000 0008 0000 0000 0004 0b9f 2400 0004
1300500  0000 c300 0004 0bbf a000 0008 0000 0044 0004 0bcf a000 0004 0000 0048 0004 0be8 8400 0000 0000 c300 0000 0000 4400 001b
1300560  0000 c300 0000 0000 4400 001b 0000 c314 0004 0bfd 8000 0000 0000 0000 0004 0c0a 8000 0000 0000 0000 0000 0000 4400 001c
1300640  0000 c314 0000 0000 4400 001a 0000 c314 0004 0c18 8000 0000 0000 0000 0004 0c36 2400 0004 0000 c330 0004 0c56 a000 0008
1300720  0000 0044 0004 0c66 a000 0004 0000 0048 0000 0000 4400 001a 0000 c344 0004 0c77 8000 0000 0000 0000 0004 0c84 8000 0000
1301000  0000 0000 0000 0000 4400 001b 0000 c344 0000 0000 4400 0019 0000 c344 0004 0c92 8000 0000 0000 0000 0004 0cb0 2400 0001
1301060  0000 c360 0004 0ccd a000 0008 0000 0044 0004 0cdd a000 0001 0000 0048 0004 0cee a000 0008 0000 004c 0000 0000 4400 0019
1301140  0000 c37c 0004 0cff 8000 0000 0000 0000 0004 0d0c 8000 0000 0000 0000 0000 0000 4400 001a 0000 c37c 0004 0d1a 8000 0000
1301220  0000 0000 0000 0000 4400 001b 0000 c37c 0000 0000 4400 0018 0000 c37c 0004 0d28 8000 0000 0000 0000 0004 0d43 2400 0001
1301300  0000 c38c 0004 0d60 a000 0008 0000 0044 0004 0d70 a000 0001 0000 0048 0004 0d81 a000 0004 0000 004c 0000 0000 4400 0018
1301360  0000 c3a4 0004 0d91 8000 0000 0000 0000 0004 0d9e 8000 0000 0000 0000 0000 0000 4400 0019 0000 c3a4 0004 0dac 8000 0000
1301440  0000 0000 0000 0000 4400 001a 0000 c3a4 0000 0000 4400 0017 0000 c3a4 0004 0dba 8000 0000 0000 0000 0004 0dd5 2400 0001
1301520  0000 c3b4 0004 0df3 a000 0008 0000 0044 0004 0e03 a000 0001 0000 0048 0004 0e14 a000 0001 0000 004c 0000 0000 4400 0017
1301600  0000 c3cc 0004 0e25 8000 0000 0000 0000 0004 0e32 8000 0000 0000 0000 0000 0000 4400 0018 0000 c3cc 0004 0e40 8000 0000
1301660  0000 0000 0000 0000 4400 0019 0000 c3cc 0000 0000 4400 0016 0000 c3cc 0004 0e4e 8000 0000 0000 0000 0004 0e6a 2400 0001
1301740  0000 c3dc 0004 0e88 a000 0008 0000 0044 0004 0e98 a000 0001 0000 0048 0004 0ea9 a000 0004 0000 004c 0000 0000 4400 0016
1302020  0000 c3f4 0004 0eb9 8000 0000 0000 0000 0004 0ec6 8000 0000 0000 0000 0000 0000 4400 0017 0000 c3f4 0004 0ed4 8000 0000
1302100  0000 0000 0000 0000 4400 0018 0000 c3f4 0000 0000 4400 0015 0000 c3f4 0004 0ee2 8000 0000 0000 0000 0004 0efd 2400 0001
1302160  0000 c410 0004 0f19 a000 0008 0000 0044 0004 0f29 a000 0004 0000 0048 0000 0000 4400 0015 0000 c424 0004 0f39 8000 0000
```

| | | | | | | | | | | | | | | | | | | | | | | | | |
|---|---|---|---|---|---|---|---|---|---|---|---|---|---|---|---|---|---|---|---|---|---|---|---|---|
| 1302240 | 0000 | 0000 | 0004 | 0f46 | 8000 | 0000 | 0000 | 0000 | 0000 | 0000 | 4400 | 0016 | 0000 | c424 | 0000 | 0000 | 4400 | 0014 | 0000 | c424 | 0004 | 0f54 | 8000 | 0000 |
| 1302320 | 0000 | 0000 | 0004 | 0f6d | 2400 | 0001 | 0000 | c440 | 0004 | 0f89 | a000 | 0008 | 0000 | 0044 | 0004 | 0f99 | a000 | 0001 | 0000 | 0048 | 0000 | 0000 | 4400 | 0012 |
| 1302400 | 0000 | c440 | 0004 | 0fa6 | 4000 | 0008 | 0000 | 0018 | 0000 | 0000 | 4400 | 0012 | 0000 | c450 | 0004 | 0fb6 | 8000 | 0000 | 0000 | 0000 | 0004 | 0fc3 | 8000 | 0000 |
| 1302460 | 0000 | 0000 | 0000 | 0000 | 4400 | 0013 | 0000 | c450 | 0000 | 0000 | 4400 | 0012 | 0000 | c450 | 0000 | 0000 | 4400 | 0013 | 0000 | c490 | 0004 | 0fcd | 8000 | 0000 |
| 1302540 | 0000 | 0000 | 0004 | 0fe7 | 2400 | 0004 | 0000 | c4a0 | 0004 | 1008 | a000 | 0004 | 0000 | 0044 | 0004 | 1018 | a000 | 0004 | 0000 | 0048 | 0004 | 1029 | 8400 | 0000 |
| 1302620 | 0000 | c4a0 | 0000 | 0000 | 4400 | 0015 | 0000 | c4a0 | 0000 | 0000 | 4400 | 0015 | 0000 | c4b4 | 0004 | 103d | 8000 | 0000 | 0000 | 0000 | 0004 | 104a | 8000 | 0000 |
| 1302700 | 0000 | 0000 | 0000 | 0000 | 4400 | 0016 | 0000 | c4b4 | 0000 | 0000 | 4400 | 0014 | 0000 | c4b4 | 0004 | 1058 | 8000 | 0000 | 0000 | 0000 | 0004 | 1077 | 0400 | 0000 |
| 1302760 | 0000 | c4d0 | 0004 | 1083 | 0400 | 0000 | 0000 | c4d0 | 0004 | 1094 | 0800 | 0000 | 0004 | 92d8 | 0004 | 10a3 | 0400 | 0000 | 0000 | c714 | 0004 | 10be | 6400 | 0000 |
| 1303040 | 0000 | c4d0 | 0004 | 10ec | 6400 | 0000 | 0000 | c440 | 0004 | 10f8 | 8400 | 0000 | 0000 | c4d0 | 0004 | 1106 | 8000 | 0000 | 0000 | 0000 | 0004 | 1130 | 8000 | 0000 |
| 1303120 | 0000 | 0000 | 0004 | 114a | 8000 | 0000 | 0000 | 0000 | 0004 | 1175 | 8000 | 0000 | 0000 | 0000 | 0004 | 1197 | 8000 | 0000 | 0000 | 0000 | 0004 | 11ba | 8000 | 0000 |
| 1303200 | 0000 | 0000 | 0004 | 11e0 | 8000 | 0000 | 0000 | 0000 | 0004 | 1202 | 8000 | 0000 | 0000 | 0000 | 0004 | 1223 | 8000 | 0000 | 0000 | 0000 | 0004 | 123c | 8000 | 0000 |
| 1303260 | 0000 | 0000 | 0004 | 1257 | 8000 | 0000 | 0000 | 0000 | 0004 | 126b | 8000 | 0000 | 0000 | 0000 | 0004 | 127d | 8000 | 0004 | ffff | fb05 | 0004 | 129b | 8000 | 0008 |
| 1303340 | ffff | fb05 | 0004 | 12d8 | 8000 | 0001 | ffff | fb05 | 0004 | 12f5 | 8000 | 0004 | ffff | fb05 | 0004 | 1303 | 8000 | 0004 | ffff | fb05 | 0004 | 1314 | 8000 | 0004 |
| 1303420 | ffff | fb05 | 0004 | 1325 | 8000 | 0004 | ffff | fb05 | 0004 | 139c | 8000 | 0004 | ffff | fb05 | 0004 | 1434 | 8000 | 0004 | ffff | fb05 | 0004 | 1478 | 8000 | 0004 |
| 1303500 | ffff | fb05 | 0004 | 14f8 | 8000 | 0004 | ffff | fb05 | 0004 | 1572 | 8000 | 0004 | ffff | fb05 | 0004 | 15a0 | 8000 | 003c | ffff | fb05 | 0004 | 16b7 | 8000 | 003c |
| 1303560 | ffff | fb05 | 0004 | 17b3 | 2000 | 0004 | 0000 | 0000 | 0004 | 17ca | 2000 | 0004 | 0000 | 0000 | 0004 | 17e3 | 2000 | 0004 | 0000 | 0000 | 0004 | 17fb | 2000 | 0004 |
| 1303640 | 0000 | 0000 | 0004 | 1910 | 2000 | 0004 | 0000 | 0000 | 0004 | 1926 | 2000 | 0001 | 0000 | 0000 | 0004 | 183f | 8000 | 0000 | 0000 | 0000 | 0004 | 1905 | 8000 | 0000 |
| 1303720 | 0000 | 0000 | 0004 | 19cb | 8000 | 0000 | 0000 | 0000 | 0004 | 1a9b | 8000 | 0000 | 0000 | 0000 | 0004 | 1adf | 8000 | 0028 | ffff | fb05 | 0004 | 1c00 | 8000 | 0028 |
| 1304000 | ffff | fb05 | 0004 | 1c65 | 8000 | 0000 | 0000 | 0000 | 0004 | 1d30 | 8000 | 0000 | 0000 | 0000 | 0004 | 1dfb | 8000 | 0000 | 0000 | 0000 | 0004 | 1eb9 | 8000 | 0000 |
| 1304060 | 0000 | 0000 | 0004 | 1f7d | 8000 | 0000 | 0000 | 0000 | 0004 | 2042 | 8000 | 0000 | 0000 | 0000 | 0004 | 20a1 | 8000 | 0048 | ffff | fb05 | 0004 | 211f | 8000 | 0000 |
| 1304140 | 0000 | 0000 | 0004 | 21e3 | 8000 | 0000 | 0000 | 0000 | 0004 | 22ad | 8000 | 0000 | 0000 | 0000 | 0004 | 2382 | 8000 | 0000 | 0000 | 0000 | 0004 | 244e | 8000 | 0000 |
| 1304220 | 0000 | 0000 | 0004 | 24ec | 8000 | 0044 | ffff | fb05 | 0004 | 2543 | 8000 | 0000 | 0000 | 0000 | 0004 | 2609 | 8000 | 0000 | 0000 | 0000 | 0004 | 26d4 | 8000 | 0000 |
| 1304300 | 0000 | 0000 | 0004 | 27a1 | 8000 | 0000 | 0000 | 0000 | 0004 | 27e3 | 2400 | 0044 | 0000 | c4d0 | 0004 | 2803 | a000 | 0044 | 0000 | 0044 | 0004 | 2813 | a000 | 0001 |
| 1304360 | 0000 | 0048 | 0004 | 281f | 8400 | 0000 | 0000 | c4d0 | 0000 | 0000 | 4400 | 01d1 | 0000 | c4d0 | 0004 | 283c | 4000 | 0044 | 0000 | 0018 | 0000 | 0000 | 4400 | 01d1 |
| 1304440 | 0000 | c4e0 | 0004 | 284c | 8000 | 0000 | 0000 | 0000 | 0004 | 2859 | 8000 | 0000 | 0000 | 0000 | 0000 | 0000 | 4400 | 01d2 | 0000 | c4e0 | 0000 | 0000 | 4400 | 01d3 |
| 1304520 | 0000 | c514 | 0000 | 0000 | 4400 | 01d4 | 0000 | c5b8 | 0000 | 0000 | 4400 | 01d6 | 0000 | c5e8 | 0000 | 0000 | 4400 | 01d8 | 0000 | c618 | 0000 | 0000 | 4400 | 01d9 |
| 1304600 | 0000 | c624 | 0004 | 2863 | 8000 | 0000 | 0000 | 0000 | 0004 | 2878 | 8000 | 0050 | ffff | fb05 | 0004 | 28f3 | 8000 | 0000 | 0000 | 0000 | 0004 | 297a | 2000 | 0000 |
| 1304660 | 0000 | 0000 | 0004 | 299c | 2000 | 0000 | 0000 | 0000 | 0004 | 29bf | 2000 | 0000 | 0000 | 0000 | 0004 | 29cc | 2000 | 0000 | 0000 | 0000 | 0004 | 29d9 | 8000 | 0001 |
| 1304740 | ffff | fb05 | 0004 | 2a13 | 2000 | 0004 | 0000 | 0000 | 0004 | 2a35 | 2000 | 0004 | 0000 | 0000 | 0004 | 2a57 | 8000 | 0000 | 0000 | 0000 | 0004 | 2ae4 | 2800 | 0001 |
| 1305020 | 0004 | 92d8 | 0004 | 2afa | 8000 | 0004 | ffff | fb05 | 0004 | 2b06 | 8000 | 0008 | ffff | fb05 | 0004 | 2b69 | 8000 | 0000 | 0000 | 0000 | 0004 | 2be5 | 8000 | 0004 |
| 1305100 | ffff | fb05 | 0004 | 2c1a | 8000 | 0000 | 0000 | 0000 | 0004 | 2c6e | 8000 | 0008 | ffff | fb05 | 0004 | 2cd9 | 8000 | 0000 | 0000 | 0000 | 0004 | 2d3f | 8000 | 0004 |
| 1305160 | ffff | fb05 | 0004 | 2d74 | 8000 | 0000 | 0000 | 0000 | 0004 | 2dd0 | 8000 | 0008 | ffff | fb05 | 0004 | 2e33 | 8000 | 0000 | 0000 | 0000 | 0004 | 2e99 | 8000 | 0004 |
| 1305240 | ffff | fb05 | 0004 | 2ece | 8000 | 0000 | 0000 | 0000 | 0004 | 2f2a | 8000 | 0008 | ffff | fb05 | 0004 | 2f98 | 8000 | 0000 | 0000 | 0000 | 0004 | 3025 | 8000 | 0004 |
| 1305320 | ffff | fb05 | 0004 | 305c | 8000 | 0000 | 0000 | 0000 | 0004 | 30be | 8000 | 0008 | ffff | fb05 | 0004 | 3114 | 8000 | 0000 | 0000 | 0000 | 0004 | 3195 | 8000 | 0004 |
| 1305400 | ffff | fb05 | 0004 | 31cc | 8000 | 0000 | 0000 | 0000 | 0004 | 3224 | 8000 | 0008 | ffff | fb05 | 0004 | 327a | 8000 | 0000 | 0000 | 0000 | 0004 | 32e4 | 8000 | 0004 |
| 1305460 | ffff | fb05 | 0004 | 331b | 8000 | 0000 | 0000 | 0000 | 0004 | 337b | 8000 | 0008 | ffff | fb05 | 0004 | 33d1 | 8000 | 0000 | 0000 | 0000 | 0004 | 343b | 8000 | 0004 |
| 1305540 | ffff | fb05 | 0004 | 3472 | 8000 | 0000 | 0000 | 0000 | 0004 | 34d2 | 8000 | 0008 | ffff | fb05 | 0004 | 352b | 8000 | 0000 | 0000 | 0000 | 0004 | 35bd | 8000 | 0004 |
| 1305620 | ffff | fb05 | 0004 | 35f6 | 8000 | 0000 | 0000 | 0000 | 0004 | 365c | 2000 | 0004 | 0000 | 0000 | 0004 | 3669 | 2000 | 0004 | 0000 | 0000 | 0004 | 3679 | 8000 | 0034 |
| 1305700 | ffff | fb05 | 0004 | 3792 | 8000 | 0034 | ffff | fb05 | 0004 | 3874 | 8000 | 0000 | 0000 | 0000 | 0004 | 393e | 8000 | 0000 | 0000 | 0000 | 0004 | 396b | 8000 | 0040 |
| 1305760 | ffff | fb05 | 0004 | 3a83 | 8000 | 0040 | ffff | fb05 | 0004 | 3b9d | 2000 | 0004 | 0000 | 0000 | 0004 | 3bb7 | 8000 | 0000 | 0000 | 0000 | 0004 | 3c84 | 8000 | 0000 |
| 1306040 | 0000 | 0000 | 0004 | 3d2f | 8000 | 0084 | ffff | fb05 | 0004 | 3db4 | 8000 | 0000 | 0000 | 0000 | 0004 | 3e89 | 8000 | 0000 | 0000 | 0000 | 0004 | 3f05 | 8000 | 0004 |
| 1306120 | ffff | fb05 | 0004 | 3f19 | 8000 | 0004 | ffff | fb05 | 0004 | 3f48 | 8000 | 0000 | 0000 | 0000 | 0004 | 3fcd | 2000 | 0008 | 0000 | 0000 | 0004 | 3ff4 | 8000 | 0008 |
| 1306200 | ffff | fb05 | 0004 | 3fff | 8000 | 0008 | ffff | fb05 | 0004 | 400b | 8000 | 0008 | ffff | fb05 | 0004 | 4017 | 2400 | 0001 | 0000 | c634 | 0004 | 4038 | a000 | 0004 |
| 1306260 | 0000 | 0044 | 0004 | 4050 | a000 | 0001 | 0000 | 0048 | 0004 | 405e | a000 | 0001 | 0000 | 004c | 0004 | 406c | 8400 | 0000 | 0000 | c634 | 0000 | 0000 | 4400 | 000c |
| 1306340 | 0000 | c634 | 0000 | 0000 | 4400 | 000c | 0000 | c64c | 0004 | 407a | 8000 | 0000 | 0000 | 0000 | 0004 | 4087 | 8000 | 0000 | 0000 | 0000 | 0000 | 0000 | 4400 | 000d |
| 1306420 | 0000 | c64c | 0004 | 4092 | 8000 | 0000 | 0000 | 0000 | 0000 | 0000 | 4400 | 000e | 0000 | c64c | 0000 | 0000 | 4400 | 000d | 0000 | c64c | 0000 | 0000 | 4400 | 000e |
| 1306500 | 0000 | c664 | 0000 | 0000 | 4400 | 000f | 0000 | c670 | 0004 | 409d | 8000 | 0000 | 0000 | 0000 | 0004 | 40bc | 2400 | 0001 | 0000 | c680 | 0004 | 40d7 | a000 | 0004 |
| 1306560 | 0000 | 0044 | 0004 | 40e7 | a000 | 0001 | 0000 | 0048 | 0000 | 0000 | 4400 | 0012 | 0000 | c680 | 0000 | 0000 | 4400 | 0012 | 0000 | c694 | 0004 | 40f4 | 8000 | 0000 |
| 1306640 | 0000 | 0000 | 0004 | 4101 | 8000 | 0000 | 0000 | 0000 | 0000 | 0000 | 4400 | 0013 | 0000 | c694 | 0000 | 0000 | 4400 | 0014 | 0000 | c6a8 | 0004 | 410b | 8000 | 0000 |
| 1306720 | 0000 | 0000 | 0004 | 4124 | 2400 | 0001 | 0000 | c6b8 | 0004 | 414d | 8400 | 0000 | 0000 | c6b8 | 0000 | 0000 | 4400 | 023b | 0000 | c6b8 | 0000 | 0000 | 4400 | 023b |
| 1307000 | 0000 | c6c4 | 0000 | 0000 | 4400 | 023c | 0000 | c634 | 0004 | 416a | 2400 | 0001 | 0000 | c6e4 | 0000 | 0000 | 4400 | 023b | 0000 | c6e4 | 0000 | 0000 | 4400 | 023b |
| 1307060 | 0000 | c6f0 | 0000 | 0000 | 4400 | 023c | 0000 | c704 | 0004 | 4193 | 2000 | 0008 | 0000 | 0000 | 0004 | 41be | 2400 | 0004 | 0000 | c714 | 0004 | 41df | a000 | 0004 |
| 1307140 | 0000 | 0044 | 0004 | 41ef | a000 | 0004 | 0000 | 0048 | 0004 | 4200 | 8400 | 0000 | 0000 | c714 | 0000 | 0000 | 4400 | 0015 | 0000 | c714 | 0000 | 0000 | 4400 | 0015 |
| 1307220 | 0000 | c728 | 0004 | 4214 | 8000 | 0000 | 0000 | 0000 | 0004 | 4221 | 8000 | 0000 | 0000 | 0000 | 0000 | 0000 | 4400 | 0016 | 0000 | c728 | 0000 | 0000 | 4400 | 0014 |
| 1307300 | 0000 | c728 | 0004 | 422f | 8000 | 0000 | 0000 | 0000 | 0004 | 424e | 0400 | 0000 | 0000 | c748 | 0004 | 4259 | 0400 | 0000 | 0000 | c748 | 0004 | 426a | 0800 | 0000 |

```
1307360 0004 92e0 0004 4279 0400 0000 0000 d958 0004 4290 0400 0000 0000 d9d0 0004 42ab 6400 0000 0000 c748 0004 42db 6400 0000
1307440 0000 c748 0004 42e6 8400 0000 0000 c746 0004 42f3 8000 0000 0000 0000 0004 431d 8000 0000 0000 0000 0004 4337 8000 0000
1307520 0000 0000 0004 4362 8000 0000 0000 0000 0004 4384 8000 0000 0000 0000 0004 43a7 8000 0000 0000 0000 0004 43cd 8000 0000
1307600 0000 0000 0004 43ef 8000 0000 0000 0000 0004 4410 8000 0000 0000 0000 0004 4429 8000 0000 0000 0000 0004 4444 8000 0000
1307660 0000 0000 0004 4458 8000 0000 0000 0000 0004 446a 8000 0004 ffff fb05 0004 4488 8000 0008 ffff fb05 0004 44c5 8000 0001
1307740 ffff fb05 0004 44e2 8000 0004 ffff fb05 0004 44f0 8000 0004 ffff fb05 0004 4501 8000 0004 ffff fb05 0004 4512 8000 0004
1310020 ffff fb05 0004 4589 8000 0004 ffff fb05 0004 4621 8000 0004 ffff fb05 0004 4665 8000 0004 ffff fb05 0004 46e5 8000 0004
1310100 ffff fb05 0004 475f 8000 0004 ffff fb05 0004 478d 8000 003c ffff fb05 0004 48a4 8000 003c ffff fb05 0004 49a0 2000 0004
1310160 0000 0000 0004 49b7 2000 0004 0000 0000 0004 49d0 2000 0004 0000 0000 0004 49e8 2000 0004 0000 0000 0004 49fd 2000 0004
1310240 0000 0000 0004 4a13 2000 0001 0000 0000 0004 4a2c 8000 0000 0000 0000 0004 4af2 8000 0000 0000 0000 0004 4bb8 8000 0000
1310320 0000 0000 0004 4c78 8000 0000 0000 0000 0004 4ccc 8000 0028 ffff fb05 0004 4ded 8000 0028 ffff fb05 0004 4e52 8000 0000
1310400 0000 0000 0004 4f1d 8000 0000 0000 0000 0004 4fe8 8000 0000 0000 0000 0004 50a6 8000 0000 0000 0000 0004 516a 8000 0000
1310460 0000 0000 0004 522f 8000 0000 0000 0000 0004 528e 8000 0048 ffff fb05 0004 530c 8000 0000 0000 0000 0004 53d0 8000 0000
1310540 0000 0000 0004 549a 8000 0000 0000 0000 0004 556f 8000 0000 0000 0000 0004 563b 8000 0000 0000 0000 0004 56d9 8000 0044
1310620 ffff fb05 0004 5730 8000 0000 0000 0000 0004 57f6 8000 0000 0000 0000 0004 58c1 8000 0000 0000 0000 0004 598e 8000 0000
1310700 0000 0000 0004 59d0 2400 0044 0000 c748 0004 59f0 a000 0044 0000 0044 0004 5a00 a000 0001 0000 0048 0004 5a0c 8400 0000
1310760 0000 c748 0000 0000 4400 01d1 0000 c748 0004 5a29 4000 0044 0000 0018 0000 0000 4400 01d1 0000 c758 0004 5a39 8000 0000
1311040 0000 0000 0004 5a46 8000 0000 0000 0000 0000 0000 4400 01d2 0000 c758 0000 0000 4400 01d3 0000 c78c 0000 0000 4400 01d4
1311120 0000 c830 0000 0000 4400 01d6 0000 c860 0000 0000 4400 01d8 0000 c890 0000 0000 4400 01d9 0000 c89c 0004 5a50 8000 0000
1311200 0000 0000 0004 5a65 8000 0050 ffff fb05 0004 5ae0 8000 0000 0000 0000 0004 5b67 2000 0000 0000 0000 0004 5b89 2000 0000
1311260 0000 0000 0004 5bac 2000 0000 0000 0000 0004 5bb9 2000 0000 0000 0000 0004 5bc6 8000 0001 ffff fb05 0004 5c00 2000 0004
1311340 0000 0000 0004 5c22 2000 0004 0000 0000 0004 5c44 8000 0000 0000 0000 0004 5cd1 2800 0001 0004 92e0 0004 5ce7 8000 0004
1311420 ffff fb05 0004 5cf3 8000 0008 ffff fb05 0004 5d56 8000 0000 0000 0000 0004 5dd2 8000 0004 ffff fb05 0004 5e07 8000 0000
1311500 0000 0000 0004 5e5b 8000 0008 ffff fb05 0004 5ec6 8000 0000 0000 0000 0004 5f2c 8000 0004 ffff fb05 0004 5f61 8000 0000
1311560 0000 0000 0004 5fbd 8000 0008 ffff fb05 0004 6020 8000 0000 0000 0000 0004 6086 8000 0004 ffff fb05 0004 60bb 8000 0000
1311640 0000 0000 0004 6117 8000 0008 ffff fb05 0004 6195 8000 0000 0000 0000 0004 6212 8000 0004 ffff fb05 0004 6249 8000 0000
1311720 0000 0000 0004 62ab 8000 0008 ffff fb05 0004 6301 8000 0000 0000 0000 0004 6382 8000 0004 ffff fb05 0004 63b9 8000 0000
1312000 0000 0000 0004 6411 8000 0008 ffff fb05 0004 6467 8000 0000 0000 0000 0004 64d1 8000 0004 ffff fb05 0004 6508 8000 0000
1312060 0000 0000 0004 6568 8000 0008 ffff fb05 0004 65be 8000 0000 0000 0000 0004 6628 8000 0004 ffff fb05 0004 665f 8000 0000
1312140 0000 0000 0004 66bf 8000 0008 ffff fb05 0004 6718 8000 0000 0000 0000 0004 67aa 8000 0004 ffff fb05 0004 67e3 8000 0000
1312220 0000 0000 0004 6849 2000 0004 0000 0000 0004 6856 2000 0004 0000 0000 0004 6866 8000 0034 ffff fb05 0004 697f 8000 0034
1312300 ffff fb05 0004 6a61 8000 0000 0000 0000 0004 6b2b 8000 0000 0000 0000 0004 6b58 8000 0040 ffff fb05 0004 6c70 8000 0040
1312360 ffff fb05 0004 6d8a 2000 0004 0000 0000 0004 6da4 8000 0000 0000 0000 0004 6e71 8000 0000 0000 0000 0004 6f1c 8000 0084
1312440 ffff fb05 0004 6fa1 8000 0000 0000 0000 0004 7076 8000 0000 0000 0000 0004 70f2 8000 0004 ffff fb05 0004 7106 8000 0004
1312520 ffff fb05 0004 7135 8000 0000 0000 0000 0004 71ba 2000 0008 0000 0000 0004 71e0 8000 0008 ffff fb05 0004 71eb 8000 0008
1312600 ffff fb05 0004 71f7 8000 0008 ffff fb05 0004 7203 8000 0008 ffff fb05 0004 724f 8000 0000 0000 0000 0004 7315 8000 0000
1312660 0000 0000 0004 7377 8000 0044 ffff fb05 0004 73d9 8000 0000 0000 0000 0004 749f 8000 0000 0000 0000 0004 74ca 8000 0008
1312740 ffff fb05 0004 74d6 8000 000c ffff fb05 0004 7549 8000 0000 0000 0000 0004 75d5 8000 0008 ffff fb05 0004 7629 8000 0000
1313020 0000 0000 0004 76a9 8000 000c ffff fb05 0004 771f 8000 0000 0000 0000 0004 77ca 2000 0008 0000 0000 0004 77f2 8000 000c
1313100 ffff fb05 0004 7856 8000 0000 0000 0000 0004 7917 8000 0000 0000 0000 0004 7987 2000 0008 0000 0000 0004 79ab 8000 000c
1313160 ffff fb05 0004 7a10 8000 0000 0000 0000 0004 7ade 8000 0000 0000 0000 0004 7b4c 2000 0008 0000 0000 0004 7b71 2400 0008
1313240 0000 c8ac 0004 7b93 a000 000c 0000 0044 0004 7bab a000 000c 0000 0048 0004 7bc4 8400 0000 0000 c8ac 0000 0000 4400 0011
1313320 0000 c8ac 0000 0000 4400 0011 0000 c8c0 0004 7bd1 8000 0000 0000 0000 0004 7bde 8000 0000 0000 0000 0000 0000 4400 0012
1313400 0000 c8c0 0000 0000 4400 0019 0000 c8c0 0000 0000 4400 001a 0000 c8d0 0000 0000 4400 001b 0000 c8e0 0004 7bec 8000 0000
1313460 0000 0000 0004 7c0b 2400 0001 0000 c8f0 0004 7c29 a000 000c 0000 0044 0004 7c39 a000 000c 0000 0048 0000 0000 4400 0020
1313540 0000 c8f0 0004 7c46 4000 000c 0000 0018 0000 0000 4400 0020 0000 c900 0004 7c56 8000 000c ffff fffc 0004 7c62 8000 000c
1313620 ffff fff8 0004 7c6f 8000 000c ffff fff4 0004 7c89 8000 0008 ffff fff0 0004 7ca0 8000 0008 ffff ffec 0004 7cba 8000 0008
1313700 ffff ffe8 0000 0000 c000 0002 0000 01b8 0004 7cd1 8000 0000 0000 0000 0000 0000 4400 0025 0000 c900 0004 7cde 8000 0000
1313760 0000 0000 0000 0000 4400 0026 0000 c900 0004 7ce8 8000 0000 0000 0000 0000 0000 4400 0027 0000 c900 0004 7cf1 8000 0000
1314040 0000 0000 0000 0000 4400 0028 0000 c900 0004 7cfb 8000 0000 0000 0000 0000 0000 4400 0029 0000 c900 0004 7d06 8000 0000
1314120 0000 0000 0000 0000 4400 002a 0000 c900 0004 7d1e 8000 0000 0000 0000 0000 0000 4400 002b 0000 c900 0004 7d33 8000 0000
1314200 0000 0000 0000 0000 4400 002c 0000 c900 0004 7d4b 8000 0000 0000 0000 0000 0000 4400 002d 0000 c900 0000 0000 4400 0025
1314260 0000 c900 0000 0000 4400 0026 0000 c91c 0000 0000 4400 0027 0000 ca2c 0000 0000 4400 0025 0000 ca3c 0000 0000 e000 0002
1314340 0000 0328 0000 0000 4400 0029 0000 ca70 0004 7d60 8000 0000 0000 0000 0004 7d7c 2400 0004 0000 ca80 0004 7d9d a000 000c
1314420 0000 0044 0004 7dad a000 000c 0000 0048 0000 0000 4400 002d 0000 ca80 0004 7dbe 4000 000c 0000 0018 0000 0000 4400 002d
```

```
1314500  0000 ca90 0004 7dce 8000 0008 ffff fffc 0004 7ddf 8000 000c ffff fff8 0004 7ded 8000 0008 ffff fff4 0004 7dff 8000 000c
1314560  ffff fff0 0004 7e0e 8000 0008 ffff ffec 0004 7e25 8000 0008 ffff ffe8 0004 7e3f 8000 0008 ffff ffe4 0000 0000 c000 0002
1314640  0000 0348 0004 7e56 8000 0000 0000 0000 0000 0000 4400 0034 0000 ca90 0004 7e63 8000 0000 0000 0000 0000 0000 4400 0035
1314720  0000 ca90 0004 7e71 8000 0000 0000 0000 0000 0000 4400 0036 0000 ca90 0004 7e80 8000 0000 0000 0000 0000 0000 4400 0037
1315000  0000 ca90 0004 7e8c 8000 0000 0000 0000 0000 0000 4400 0038 0000 ca90 0004 7e9c 8000 0000 0000 0000 0000 0000 4400 0039
1315060  0000 ca90 0004 7ea9 8000 0000 0000 0000 0000 0000 4400 003a 0000 ca90 0004 7ebe 8000 0000 0000 0000 0000 0000 4400 003b
1315140  0000 ca90 0004 7ed6 8000 0000 0000 0000 0000 0000 4400 003c 0000 ca90 0000 0000 4400 002f 0000 ca90 0000 0000 4400 0030
1315220  0000 ca9c 0000 0000 4400 0031 0000 caa4 0000 0000 4400 0034 0000 cab0 0000 0000 4400 0035 0000 cacc 0000 0000 4400 0036
1315300  0000 cb00 0000 0000 4400 0037 0000 cb0c 0000 0000 4400 0038 0000 cb18 0000 0000 4400 003a 0000 cb24 0000 0000 4400 003b
1315360  0000 cb60 0000 0000 4400 003c 0000 cb6c 0000 0000 4400 003d 0000 cb88 0000 0000 4400 003e 0000 cbc8 0000 0000 4400 003f
1315440  0000 cbd4 0000 0000 4400 0040 0000 cbe0 0000 0000 4400 0043 0000 cbec 0000 0000 4400 003a 0000 cbf4 0000 0000 4400 0045
1315520  0000 cc28 0000 0000 e000 0002 0000 04ec 0000 0000 4400 0046 0000 cc34 0004 7eeb 8000 0000 0000 0000 0004 7f0a 2400 0004
1315600  0000 cc44 0004 7f23 a000 000c 0000 0044 0004 7f33 a000 0001 0000 0048 0000 0000 4400 004a 0000 cc44 0004 7f40 4000 000c
1315660  0000 0018 0000 0000 4400 004a 0000 cc54 0004 7f50 8000 0008 ffff fffc 0004 7f5f 8000 0008 ffff fff8 0004 7f71 8000 0008
1315740  ffff fff4 0004 7f84 8000 0008 ffff fff0 0004 7f92 8000 0008 ffff ffec 0004 7fa9 8000 0008 ffff ffe8 0004 7fc3 8000 0008
1316020  ffff ffe4 0000 0000 c000 0002 0000 050c 0004 7fda 8000 0000 0000 0000 0000 0000 4400 0050 0000 cc54 0004 7fe7 8000 0000
1316100  0000 0000 0000 0000 4400 0051 0000 cc54 0004 7ff1 8000 0000 0000 0000 0000 0000 4400 0052 0000 cc54 0004 7ffe 8000 0000
1316160  0000 0000 0000 0000 4400 0053 0000 cc54 0004 800e 8000 0000 0000 0000 0000 0000 4400 0054 0000 cc54 0004 801f 8000 0000
1316240  0000 0000 0000 0000 4400 0055 0000 cc54 0004 802b 8000 0000 0000 0000 0000 0000 4400 0056 0000 cc54 0004 8040 8000 0000
1316320  0000 0000 0000 0000 4400 0057 0000 cc54 0004 8058 8000 0000 0000 0000 0000 0000 4400 0058 0000 cc54 0000 0000 4400 004e
1316400  0000 cc54 0000 0000 4400 0050 0000 cc5c 0000 0000 4400 0051 0000 cc68 0000 0000 4400 0052 0000 cc88 0000 0000 4400 0053
1316460  0000 ccbc 0000 0000 4400 0054 0000 ccc8 0000 0000 4400 0055 0000 ccd4 0000 0000 4400 0057 0000 cce0 0000 0000 4400 0058
1316540  0000 cd1c 0000 0000 4400 0059 0000 cd28 0000 0000 4400 005a 0000 cd48 0000 0000 4400 005b 0000 cd88 0000 0000 4400 005c
1316620  0000 cd94 0000 0000 4400 005d 0000 cda0 0000 0000 4400 0060 0000 cdac 0000 0000 4400 0057 0000 cdb4 0000 0000 4400 0062
1316700  0000 cde8 0000 0000 e000 0002 0000 06ac 0000 0000 4400 0063 0000 cdf4 0004 806d 8000 0000 0000 0000 0004 8084 2400 0001
1316760  0000 ce04 0004 80ac a000 000c 0000 0044 0004 80bc a000 000c 0000 0048 0004 80cc a000 000c 0000 004c 0000 0000 4400 0067
1317040  0000 ce04 0004 80de 4000 000c 0000 0018 0000 0000 4400 0067 0000 ce18 0004 80ee 8000 0008 ffff fffc 0004 80fd 8000 0004
1317120  ffff fff8 0004 810b 8000 0008 ffff fff4 0004 8125 8000 0008 ffff fff0 0000 0000 c000 0002 0000 06d0 0004 813c 8000 0000
1317200  0000 0000 0000 0000 4400 006b 0000 ce18 0004 8149 8000 0000 0000 0000 0000 0000 4400 006c 0000 ce18 0004 8156 8000 0000
1317260  0000 0000 0000 0000 4400 006d 0000 ce18 0004 8165 8000 0000 0000 0000 0000 0000 4400 006e 0000 ce18 0004 8172 8000 0000
1317340  0000 0000 0000 0000 4400 006f 0000 ce18 0004 817f 8000 0000 0000 0000 0000 0000 4400 0070 0000 ce18 0004 8197 8000 0000
1317420  0000 0000 0000 0000 4400 0071 0000 ce18 0000 0000 4400 006b 0000 ce18 0000 0000 4400 006c 0000 ce28 0000 0000 4400 006d
1317500  0000 ce30 0000 0000 4400 0070 0000 ce48 0000 0000 4400 0071 0000 ce74 0000 0000 4400 0072 0000 ce88 0000 0000 4400 0073
1317560  0000 cec8 0000 0000 4400 0074 0000 cee4 0000 0000 4400 0070 0000 ceec 0000 0000 4400 0076 0000 cf20 0000 0000 4400 0077
1317640  0000 cf30 0000 0000 4400 0078 0000 cf4c 0000 0000 e000 0002 0000 080c 0000 0000 4400 007a 0000 cf54 0004 81ac 8000 0000
1317720  0000 0000 0004 81d2 2400 0008 0000 cf64 0004 81f5 a000 000c 0000 0044 0004 8205 a000 0008 0000 0048 0000 0000 4400 007c
1320000  0000 cf64 0004 8212 4000 000c 0000 0018 0000 0000 4400 007c 0000 cf74 0004 8222 8000 000c ffff fffc 0004 8231 8000 0008
1320060  ffff fff8 0004 8241 8000 0008 ffff fff4 0000 0000 c000 0002 0000 082c 0004 825b 8000 0000 0000 0000 0000 0000 4400 0080
1320140  0000 cf74 0004 8268 8000 0000 0000 0000 0000 0000 4400 0081 0000 cf74 0004 8272 8000 0000 0000 0000 0000 0000 4400 0082
1320220  0000 cf74 0004 827f 8000 0000 0000 0000 0000 0000 4400 0083 0000 cf74 0004 828d 8000 0000 0000 0000 0000 0000 4400 0084
1320300  0000 cf74 0000 0000 4400 007d 0000 cf74 0000 0000 4400 007e 0000 cf78 0000 0000 4400 0080 0000 cf7c 0000 0000 4400 0081
1320360  0000 cf8c 0000 0000 4400 0082 0000 cf98 0000 0000 4400 0083 0000 cfb0 0000 0000 4400 0084 0000 cfc8 0000 0000 4400 0085
1320440  0000 cff8 0000 0000 4400 0081 0000 d004 0000 0000 4400 0087 0000 d038 0000 0000 e000 0002 0000 08fc 0000 0000 4400 0088
1320520  0000 d044 0004 82a5 8000 0000 0000 0000 0004 82c5 2400 0008 0000 d054 0004 82e1 a000 000c 0000 0044 0004 82f1 a000 0001
1320600  0000 0048 0000 0000 4400 008c 0000 d054 0004 8301 4000 000c 0000 0018 0000 0000 4400 008c 0000 d064 0004 8311 8000 000c
1320660  ffff fffc 0004 8320 8000 0008 ffff fff8 0000 0000 c000 0002 0000 091c 0004 833a 8000 0000 0000 0000 0000 0000 4400 008f
1320740  0000 d064 0004 8347 8000 0000 0000 0000 0000 0000 4400 0090 0000 d064 0004 8354 8000 0000 0000 0000 0000 0000 4400 0091
1321020  0000 d064 0004 8361 8000 0000 0000 0000 0000 0000 4400 0092 0000 d064 0000 0000 4400 008d 0000 d064 0000 0000 4400 008f
1321100  0000 d068 0000 0000 4400 0090 0000 d080 0000 0000 4400 0091 0000 d0ac 0000 0000 4400 008f 0000 d0bc 0000 0000 4400 0092
1321160  0000 d0f0 0000 0000 e000 0002 0000 09b4 0000 0000 4400 0093 0000 d0fc 0004 8379 8000 0000 0000 0000 0004 8392 2400 0004
1321240  0000 d10c 0004 83b0 a000 000c 0000 0044 0004 83c0 a000 000c 0000 0048 0000 0000 4400 0098 0000 d10c 0004 83d5 4000 000c
1321320  0000 0018 0000 0000 4400 0098 0000 d11c 0004 83e5 8000 0008 ffff fffc 0000 0000 c000 0002 0000 09d4 0004 83f1 8000 0000
1321400  0000 0000 0000 0000 4400 009a 0000 d11c 0004 83fe 8000 0000 0000 0000 0000 0000 4400 009b 0000 d11c 0004 8408 8000 0000
1321460  0000 0000 0000 0000 4400 009c 0000 d11c 0004 8411 8000 0000 0000 0000 0000 0000 4400 009d 0000 d11c 0000 0000 4400 009b
1321540  0000 d11c 0000 0000 4400 009c 0000 d134 0000 0000 4400 009d 0000 d140 0000 0000 4400 009e 0000 d15c 0000 0000 4400 009f
```

```
1321620 0000 d18c 0000 0000 4400 009d 0000 d198 0000 0000 4400 00a0 0000 d1cc 0000 0000 e000 0002 0000 0a90 0000 0000 4400 00a1
1321700 0000 d1d8 0004 841b 8000 0000 0000 0000 0004 8437 2400 0001 0000 d1e8 0004 8451 a000 000c 0000 c044 0004 8461 a000 0001
1321760 0000 0048 0000 0000 4400 00a4 0000 d1e8 0004 846e 4000 000c 0000 0018 0000 0000 4400 00a4 0000 d1f8 0004 847e 8000 0008
1322040 ffff fffc 0004 848a 8000 0008 ffff fff8 0000 0000 c000 0002 0000 0ab0 0004 849a 8000 0000 0000 0000 0000 0000 4400 00ad
1322120 0000 d1f8 0004 84a7 8000 0000 0000 0000 0000 0000 4400 00ae 0000 d1f8 0004 84b1 8000 0000 0000 0000 0000 0000 4400 00af
1322200 0000 d1f8 0004 84bb 8000 0000 0000 0000 0000 0000 4400 00b0 0000 d1f8 0000 0000 4400 00a7 0000 d1f8 0000 0000 4400 00a8
1322260 0000 d208 0000 0000 4400 00a9 0000 d22c 0000 0000 4400 00aa 0000 d244 0000 0000 4400 00a9 0000 d280 0000 0000 e000 0002
1322340 0000 0b6c 0000 0000 4400 00ac 0000 d2b4 0004 84c9 8000 0000 0000 0000 0004 84e1 2400 0001 0000 d2c4 0004 84fd a000 000c
1322420 0000 c044 0004 850d a000 0004 0000 0048 0000 0000 4400 00b0 0000 d2c4 0004 851d 4000 000c 0000 0018 0000 0000 4400 00b0
1322500 0000 d2d4 0004 852d 8000 0008 ffff fffc 0004 8542 8000 0008 ffff fff8 0004 854e 8000 0008 ffff fff4 0004 855d 8000 0008
1322560 ffff fff0 0004 856d 8000 0008 ffff ffec 0004 8580 8000 0008 ffff ffe8 0004 858f a000 000c ffff ffe4 0004 85a0 8000 0004
1322640 ffff ffe0 0004 85ae 8000 0004 ffff ffdc 0004 85bd 8000 000c ffff ffd8 0004 85d7 8000 0008 ffff ffd4 0004 85ee 8000 0008
1322720 ffff ffd0 0004 8608 8000 0008 ffff ffcc 0000 0000 c000 0002 0000 0b8c 0004 861f 8000 0000 0000 0000 0000 0000 4400 00bc
1323000 0000 d2d4 0004 862c 8000 0000 0000 0000 0000 0000 4400 00bd 0000 d2d4 0004 863a 8000 0000 0000 0000 0000 0000 4400 00be
1323060 0000 d2d4 0004 864d 8000 0000 0000 0000 0000 0000 4400 00bf 0000 d2d4 0004 8657 8000 0000 0000 0000 0000 0000 4400 00c0
1323140 0000 d2d4 0004 8664 8000 0000 0000 0000 0000 0000 4400 00c1 0000 d2d4 0004 8672 8000 0000 0000 0000 0000 0000 4400 00c2
1323220 0000 d2d4 0004 8683 8000 0000 0000 0000 0000 0000 4400 00c3 0000 d2d4 0004 8690 8000 0000 0000 0000 0000 0000 4400 00c4
1323300 0000 d2d4 0004 869f 8000 0000 0000 0000 0000 0000 4400 00c5 0000 d2d4 0004 86ac 8000 0000 0000 0000 0000 0000 4400 00c6
1323360 0000 d2d4 0004 86ba 8000 0000 0000 0000 0000 0000 4400 00c7 0000 d2d4 0004 86d2 8000 0000 0000 0000 0000 0000 4400 00c8
1323440 0000 d2d4 0004 96e7 8000 0000 0000 0000 0000 0000 4400 00c9 0000 d2d4 0004 86ff 8000 0000 0000 0000 0000 0000 4400 00ca
1323520 0000 d2d4 0000 0000 4400 00ba 0000 d2d4 0000 0000 4400 00bc 0000 d2dc 0000 0000 4400 00be 0000 d304 0000 0000 4400 00bf
1323600 0000 d30c 0000 0000 4400 00c0 0000 d310 0000 0000 4400 00c2 0000 d428 0000 0000 4400 00c3 0000 d464 0000 0000 4400 00c4
1323660 0000 d470 0000 0000 4400 00c5 0000 d474 0000 0000 4400 00c6 0000 d47c 0000 0000 4400 00c7 0000 d4a4 0000 0000 4400 00c8
1323740 0000 d4d0 0000 0000 4400 00c9 0000 d510 0000 0000 4400 00ca 0000 d560 0000 0000 4400 00cb 0000 d570 0000 0000 4400 00cc
1324020 0000 d580 0000 0000 4400 00cf 0000 d590 0000 0000 4400 00d0 0000 d594 0000 0000 4400 00d2 0000 d59c 0000 0000 4400 00c6
1324100 0000 d5a4 0000 0000 4400 00d5 0000 d5d8 0000 0000 4400 00d6 0000 d6dc 0000 0000 4400 00d7 0000 d6ec 0000 0000 4400 00d9
1324160 0000 d708 0000 0000 4400 00c2 0000 d718 0000 0000 4400 00db 0000 d74c 0000 0000 4400 00dc 0000 d75c 0000 0000 e000 0002
1324240 0000 1020 0000 0000 4400 00dd 0000 d768 0004 8714 8000 0000 0000 0000 0004 872e 2400 0001 0000 d778 0004 8747 a000 000c
1324320 0000 c044 0000 0000 4400 00e1 0000 d778 0004 8757 4000 000c 0000 0018 0000 0000 4400 00e1 0000 d784 0004 8767 8000 0008
1324400 ffff fffc 0004 8773 8000 000c ffff fff8 0004 878d 8000 0008 ffff fff4 0004 87a4 8000 0008 ffff fff0 0004 87be 8000 0008
1324460 ffff ffec 0000 0000 c000 0002 0000 103c 0004 87d5 8000 0000 0000 0000 0000 0000 4400 00e5 0000 d784 0004 87e2 8000 0000
1324540 0000 0000 0000 0000 4400 00e6 0000 d784 0004 87ec 8000 0000 0000 0000 0000 0000 4400 00e7 0000 d784 0004 8804 8000 0000
1324620 0000 0050 0000 0000 4400 00e8 0000 d784 0004 8819 8000 0000 0000 0000 0000 0000 4400 00e9 0000 d784 0004 8831 8000 0000
1324700 0000 0000 0000 0000 4400 00ea 0000 d784 0000 0000 4400 00e5 0000 d784 0000 0000 4400 00e6 0000 d78c 0000 0000 4400 00e8
1324760 0000 d790 0000 0000 4400 00e9 0000 d7a0 0000 0000 4400 00e8 0000 d8b8 0000 0000 e000 0002 0000 11a4 0000 0000 4400 00ea
1325040 0000 d8ec 0004 8846 8000 0000 0000 0000 0004 885d 2400 0001 0000 d8fc 0004 8880 8400 0000 0000 d8fc 0000 0000 4400 023b
1325120 0000 d8fc 0000 0000 4400 023b 0000 d908 0000 0000 4400 023c 0000 d918 0004 889d 2400 0001 0000 d928 0000 0000 4400 023b
1325200 0000 d928 0000 0000 4400 023b 0000 d934 0000 0000 4400 023c 0000 d948 0004 88c0 2000 0008 0000 c000 0004 88ea 2000 0008
1325260 0000 0000 0004 8925 2400 0001 0000 d958 0004 8942 a000 000c 0000 0044 0004 8952 a000 0001 0000 0048 0004 895f 8400 0000
1325340 0000 d958 0000 0000 4400 0012 0000 d958 0004 8993 4000 000c 0000 0018 0000 0000 4400 0012 0000 d968 0004 89a3 8000 0000
1325420 0000 0000 0004 89b0 8000 0000 0000 0000 0000 0000 4400 0013 0000 d968 0000 0000 4400 0011 0000 d968 0000 0000 4400 0012
1325500 0000 d98c 0000 0000 4400 0013 0000 d9c0 0004 89ba 8000 0000 0000 0000 0004 89d5 2400 0004 0000 d9d0 0004 89f6 a000 0004
1325560 0000 0044 0004 8a0e a000 0004 0000 0048 0004 8a1f 8400 0000 0000 d9d0 0000 0000 4400 0015 0000 d9d0 0000 0000 4400 0015
1325640 0000 d9e4 0004 8a51 8000 0000 0000 0000 0004 8a5e 8000 0000 0000 0000 0000 0000 4400 0016 0000 d9e4 0000 0000 4400 0014
1325720 0000 d9e4 0004 8a6c 8000 0000 0000 0000 0004 8a8b 0400 0000 0000 da00 0004 8a95 0400 0000 0000 da00 0004 8aa6 0800 0000
1326000 0004 92e8 0004 dab5 0400 0000 0000 df18 0004 8ac7 0400 0000 0000 dfd8 0004 8ade 0400 0000 0000 df48 0004 8af5 0400 0000
1326060 0000 e050 0004 8b10 0400 0000 0000 dfa8 0004 8b2b 0400 0000 0000 df78 0004 8b3f 6400 0000 0000 da00 0004 8b6f 6400 0000
1326140 0000 da00 0004 8b79 8400 0000 0000 da00 0004 8b85 8000 0000 0000 0000 0004 8baf 8000 0000 0000 0000 0004 8bc9 8000 0000
1326220 0000 0000 0004 8bf4 8000 0000 0000 0000 0004 8c16 8000 0000 0000 0000 0004 8c39 8000 0000 0000 0000 0004 8c5f 8000 0000
1326300 0000 0000 0004 8c81 8000 0000 0000 0000 0004 8ca2 8000 0000 0000 0000 0004 8cbb 8000 0000 0000 0000 0004 8cd6 8000 0000
1326360 0000 0000 0004 8cea 8000 0000 0000 0000 0004 8cfc 8000 0004 ffff fb05 0004 8d1a 8000 0008 ffff fb05 0004 8d57 8000 0001
1326440 ffff fb05 0004 8d74 8000 0004 ffff fb05 0004 8d82 8000 0004 ffff fb05 0004 8d93 8000 0004 ffff fb05 0004 8da4 8000 0004
1326520 ffff fb05 0004 8e1b 8000 0004 ffff fb05 0004 8eb3 8000 0004 ffff fb05 0004 8ef7 8000 0004 ffff fb05 0004 8f77 8000 0004
1326600 ffff fb05 0004 8ff1 8000 0004 ffff fb05 0004 901f 8000 003c ffff fb05 0004 9136 8000 003c ffff fb05 0004 9232 2000 0004
1326660 0000 0000 0004 9249 2000 0004 0000 0000 0004 9262 2000 0004 0000 0000 0004 927a 2000 0004 0000 0000 0004 928f 2000 0004
```

| | | | | | | | | | | | | | | | | | | | | | | | | |
|---|---|---|---|---|---|---|---|---|---|---|---|---|---|---|---|---|---|---|---|---|---|---|---|---|
| 1326740 | 0000 | 0000 | 0004 | 92a5 | 2000 | 0001 | 0000 | 0000 | 0004 | 92be | 8000 | 0000 | 0000 | 0000 | 0004 | 9384 | 8000 | 0000 | 0000 | 0000 | 0004 | 944a | 8000 | 0000 |
| 1327020 | 0000 | 0000 | 0004 | 950a | 8000 | 0000 | 0000 | 0000 | 0004 | 955e | 8000 | 0028 | ffff | fb05 | 0004 | 967f | 8000 | 0028 | ffff | fb05 | 0004 | 96e4 | 8000 | 0000 |
| 1327100 | 0000 | 0000 | 0004 | 97af | 8000 | 0000 | 0000 | 0000 | 0004 | 987a | 8000 | 0000 | 0000 | 0000 | 0004 | 9938 | 8000 | 0000 | 0000 | 0000 | 0004 | 99fc | 8000 | 0000 |
| 1327160 | 0000 | 0000 | 0004 | 9ac1 | 8000 | 0000 | 0000 | 0000 | 0004 | 9b20 | 8000 | 0048 | ffff | fb05 | 0004 | 9b9e | 8000 | 0000 | 0000 | 0000 | 0004 | 9c62 | 8000 | 0000 |
| 1327240 | 0000 | 0000 | 0004 | 9d2c | 8000 | 0000 | 0000 | 0000 | 0004 | 9e01 | 8000 | 0000 | 0000 | 0000 | 0004 | 9ecd | 8000 | 0000 | 0000 | 0000 | 0004 | 9f6b | 8000 | 0044 |
| 1327320 | ffff | fb05 | 0004 | 9fc2 | 8000 | 0000 | 0000 | 0000 | 0004 | a088 | 8000 | 0000 | 0000 | 0000 | 0004 | a153 | 8000 | 0000 | 0000 | 0000 | 0004 | a220 | 8000 | 0000 |
| 1327400 | 0000 | 0000 | 0004 | a262 | 2400 | 0044 | 0000 | da00 | 0004 | a282 | a000 | 0044 | 0000 | 0044 | 0004 | a292 | a000 | 0001 | 0000 | 0048 | 0004 | a29e | 8400 | 0000 |
| 1327460 | 0000 | da00 | 0000 | 0000 | 4400 | 01d1 | 0000 | da00 | 0004 | a2bb | 4000 | 0044 | 0000 | 0018 | 0000 | 0000 | 4400 | 01d1 | 0000 | da10 | 0004 | a2cb | 8000 | 0000 |
| 1327540 | 0000 | 0000 | 0004 | a2d8 | 8000 | 0000 | 0000 | 0000 | 0000 | 0000 | 4400 | 01d2 | 0000 | da10 | 0000 | 0000 | 4400 | 01d3 | 0000 | da44 | 0000 | 0000 | 4400 | 01d4 |
| 1327620 | 0000 | dae8 | 0000 | 0000 | 4400 | 01d6 | 0000 | db18 | 0000 | 0000 | 4400 | 01d8 | 0000 | db48 | 0000 | 0000 | 4400 | 01d9 | 0000 | db54 | 0004 | a2e2 | 8000 | 0000 |
| 1327700 | 0000 | 0000 | 0004 | a2f7 | 8000 | 0050 | ffff | fb05 | 0004 | a372 | 8000 | 0000 | 0000 | 0000 | 0004 | a3f9 | 2000 | 0000 | 0000 | 0000 | 0004 | a41b | 2000 | 0000 |
| 1327760 | 0000 | 0000 | 0004 | a43e | 2000 | 0000 | 0000 | 0000 | 0004 | a44b | 2000 | 0000 | 0000 | 0000 | 0004 | a458 | 8000 | 0001 | ffff | fb05 | 0004 | a492 | 2000 | 0004 |
| 1330040 | 0000 | 0000 | 0004 | a4b4 | 2000 | 0004 | 0000 | 0000 | 0004 | a4d6 | 8000 | 0000 | 0000 | 0000 | 0004 | a563 | 2800 | 0001 | 0004 | 92e8 | 0004 | a579 | 8000 | 0004 |
| 1330120 | ffff | fb05 | 0004 | a585 | 8000 | 0008 | ffff | fb05 | 0004 | a5e8 | 8000 | 0000 | 0000 | 0000 | 0004 | a664 | 8000 | 0004 | ffff | fb05 | 0004 | a699 | 8000 | 0000 |
| 1330200 | 0000 | 0000 | 0004 | a6ed | 8000 | 0008 | ffff | fb05 | 0004 | a758 | 8000 | 0000 | 0000 | 0000 | 0004 | a7be | 8000 | 0004 | ffff | fb05 | 0004 | a7f3 | 8000 | 0000 |
| 1330260 | 0000 | 0000 | 0004 | a84f | 8000 | 0008 | ffff | fb05 | 0004 | a8b2 | 8000 | 0000 | 0000 | 0000 | 0004 | a918 | 8000 | 0004 | ffff | fb05 | 0004 | a94d | 8000 | 0000 |
| 1330340 | 0000 | 0000 | 0004 | a9a9 | 8000 | 0008 | ffff | fb05 | 0004 | aa17 | 8000 | 0000 | 0000 | 0000 | 0004 | aaa4 | 8000 | 0004 | ffff | fb05 | 0004 | aadb | 8000 | 0000 |
| 1330420 | 0000 | 0000 | 0004 | ab3d | 8000 | 0008 | ffff | fb05 | 0004 | ab93 | 8000 | 0000 | 0000 | 0000 | 0004 | ac14 | 8000 | 0004 | ffff | fb05 | 0004 | ac4b | 8000 | 0000 |
| 1330500 | 0000 | 0000 | 0004 | aca3 | 8000 | 0008 | ffff | fb05 | 0004 | acf9 | 8000 | 0000 | 0000 | 0000 | 0004 | ad63 | 8000 | 0004 | ffff | fb05 | 0004 | ad9a | 8000 | 0000 |
| 1330560 | 0000 | 0000 | 0004 | adfa | 8000 | 0008 | ffff | fb05 | 0004 | ae50 | 8000 | 0000 | 0000 | 0000 | 0004 | aeba | 8000 | 0004 | ffff | fb05 | 0004 | aef1 | 8000 | 0000 |
| 1330640 | 0000 | 0000 | 0004 | af51 | 8000 | 0008 | ffff | fb05 | 0004 | afaa | 8000 | 0000 | 0000 | 0000 | 0004 | b03c | 8000 | 0004 | ffff | fb05 | 0004 | b075 | 8000 | 0000 |
| 1330720 | 0000 | 0000 | 0004 | b0db | 2000 | 0004 | 0000 | 0000 | 0004 | b0e8 | 2000 | 0004 | 0000 | 0000 | 0004 | b0f8 | 8000 | 0034 | ffff | fb05 | 0004 | b211 | 8000 | 0034 |
| 1331000 | ffff | fb05 | 0004 | b2f3 | 8000 | 0000 | 0000 | 0000 | 0004 | b3bd | 8000 | 0000 | 0000 | 0000 | 0004 | b3ea | 8000 | 0040 | ffff | fb05 | 0004 | b502 | 8000 | 0040 |
| 1331060 | ffff | fb05 | 0004 | b61c | 2000 | 0004 | 0000 | 0000 | 0004 | b636 | 8000 | 0000 | 0000 | 0000 | 0004 | b703 | 8000 | 0000 | 0000 | 0000 | 0004 | b7ae | 8000 | 0084 |
| 1331140 | ffff | fb05 | 0004 | b833 | 8000 | 0000 | 0000 | 0000 | 0004 | b908 | 8000 | 0000 | 0000 | 0000 | 0004 | b984 | 8000 | 0004 | ffff | fb05 | 0004 | b998 | 8000 | 0004 |
| 1331220 | ffff | fb05 | 0004 | b9c7 | 8000 | 0000 | 0000 | 0000 | 0004 | ba4c | 2000 | 0008 | 0000 | 0000 | 0004 | ba71 | 8000 | 0008 | ffff | fb05 | 0004 | ba7c | 8000 | 0008 |
| 1331300 | ffff | fb05 | 0004 | ba88 | 8000 | 0008 | ffff | fb05 | 0004 | ba94 | 8000 | 0008 | ffff | fb05 | 0004 | bae0 | 8000 | 0000 | 0000 | 0000 | 0004 | bba6 | 8000 | 0000 |
| 1331360 | 0000 | 0000 | 0004 | bc08 | 8000 | 0044 | ffff | fb05 | 0004 | bc6a | 8000 | 0000 | 0000 | 0000 | 0004 | bd30 | 8000 | 0000 | 0000 | 0000 | 0004 | bd5b | 8000 | 0008 |
| 1331440 | ffff | fb05 | 0004 | b167 | 8000 | 000c | ffff | fb05 | 0004 | bdda | 8000 | 0000 | 0000 | 0000 | 0004 | be66 | 8000 | 0008 | ffff | fb05 | 0004 | beba | 8000 | 0000 |
| 1331520 | 0000 | 0000 | 0004 | bf3a | 8000 | 000c | ffff | fb05 | 0004 | bfb0 | 8000 | 0000 | 0000 | 0000 | 0004 | c05b | 2000 | 0008 | 0000 | 0000 | 0004 | c082 | 8000 | 000c |
| 1331600 | ffff | fb05 | 0004 | c0e6 | 8000 | 0000 | 0000 | 0000 | 0004 | c1a7 | 8000 | 0000 | 0000 | 0000 | 0004 | c217 | 2000 | 0008 | 0000 | 0000 | 0004 | c23a | 2400 | 0001 |
| 1331660 | 0000 | db64 | 0004 | c24f | a000 | 000c | 0000 | 0044 | 0004 | c267 | a000 | 0004 | 0000 | 0048 | 0004 | c278 | 8400 | 0000 | 0000 | db64 | 0000 | 0000 | 4400 | 000f |
| 1331740 | 0000 | db64 | 0000 | 0000 | 4400 | 000f | 0000 | db78 | 0004 | c28a | 8000 | 0008 | ffff | fffc | 0000 | 0000 | c000 | 0002 | 0000 | 0178 | 0004 | c299 | 8000 | 0000 |
| 1332020 | 0000 | 0000 | 0004 | c2a6 | 8400 | 0000 | 0000 | db78 | 0000 | 0000 | 4400 | 0010 | 0000 | db78 | 0004 | c2b2 | 8000 | 0000 | 0000 | 0000 | 0000 | 0000 | 4400 | 0011 |
| 1332100 | 0000 | db78 | 0004 | c2bf | 8000 | 0000 | 0000 | 0000 | 0000 | 0000 | 4400 | 0012 | 0000 | db78 | 0000 | 0000 | 4400 | 000e | 0000 | db78 | 0000 | 0000 | 4400 | 0015 |
| 1332160 | 0000 | db88 | 0000 | 0000 | 4400 | 000f | 0000 | db98 | 0000 | 0000 | 4400 | 0010 | 0000 | dba4 | 0004 | c2ce | 8000 | 0008 | ffff | fff8 | 0000 | 0000 | c000 | 0004 |
| 1332240 | 0000 | 01b4 | 0004 | c2dd | 8000 | 0000 | 0000 | 0000 | 0000 | 0000 | 4400 | 0012 | 0000 | dbb4 | 0000 | 0000 | 4400 | 0011 | 0000 | dbb4 | 0000 | 0000 | 4400 | 0012 |
| 1332320 | 0000 | dbe0 | 0000 | 0000 | 4400 | 0013 | 0000 | dbec | 0000 | 0000 | e000 | 0004 | 0000 | 01f4 | 0000 | 0000 | 4400 | 0015 | 0000 | dbfc | 0000 | 0000 | e000 | 0002 |
| 1332400 | 0000 | 0228 | 0000 | 0000 | 4400 | 0016 | 0000 | dc28 | 0004 | c2ea | 8000 | 0000 | 0000 | 0000 | 0004 | c2fd | 2400 | 0001 | 0000 | dc38 | 0004 | c31c | a000 | 000c |
| 1332460 | 0000 | 0044 | 0004 | c32c | a000 | 0008 | 0000 | 0048 | 0000 | 0000 | 4400 | 0019 | 0000 | dc38 | 0004 | c339 | 4000 | 000c | 0000 | 0018 | 0000 | 0000 | 4400 | 0019 |
| 1332540 | 0000 | dc48 | 0004 | c349 | 8000 | 0008 | ffff | fffc | 0004 | c363 | 8000 | 0008 | ffff | fff8 | 0000 | 0000 | c000 | 0002 | 0000 | 0248 | 0004 | c37a | 8000 | 0000 |
| 1332620 | 0000 | 0000 | 0000 | 0000 | 4400 | 001a | 0000 | dc48 | 0004 | c387 | 8000 | 0000 | 0000 | 0000 | 0000 | 0000 | 4400 | 001b | 0000 | dc48 | 0004 | c391 | 8000 | 0000 |
| 1332700 | 0000 | 0000 | 0000 | 0000 | 4400 | 001c | 0000 | dc48 | 0004 | c3a9 | 8000 | 0000 | 0000 | 0000 | 0000 | 0000 | 4400 | 001d | 0000 | dc48 | 0000 | 0000 | 4400 | 001a |
| 1332760 | 0000 | dc48 | 0000 | 0000 | 4400 | 001b | 0000 | dc58 | 0000 | 0000 | 4400 | 001c | 0000 | dc74 | 0000 | 0000 | 4400 | 001f | 0000 | dc84 | 0000 | 0000 | 4400 | 0020 |
| 1333040 | 0000 | dc8c | 0000 | 0000 | e000 | 0002 | 0000 | 0298 | 0000 | 0000 | 4400 | 0021 | 0000 | dc98 | 0004 | c3be | 8000 | 0000 | 0000 | 0000 | 0004 | c3db | 2400 | 0001 |
| 1333120 | 0000 | dca8 | 0004 | c3fa | a000 | 000c | 0000 | 0044 | 0004 | c40a | a000 | 0001 | 0000 | 0048 | 0004 | c418 | a000 | 0001 | 0000 | 004c | 0000 | 0000 | 4400 | 0025 |
| 1333200 | 0000 | dca8 | 0000 | 0000 | 4400 | 0025 | 0000 | dcc0 | 0004 | c426 | 8000 | 0000 | 0000 | 0000 | 0004 | c433 | 8000 | 0000 | 0000 | 0000 | 0000 | 0000 | 4400 | 0026 |
| 1333260 | 0000 | dcc0 | 0004 | c43e | 8000 | 0000 | 0000 | 0000 | 0000 | 0000 | 4400 | 0027 | 0000 | dcc0 | 0000 | 0000 | 4400 | 0026 | 0000 | dcc0 | 0000 | 0000 | 4400 | 0027 |
| 1333340 | 0000 | dcd8 | 0000 | 0000 | 4400 | 0028 | 0000 | dce4 | 0004 | c449 | 8000 | 0000 | 0000 | 0000 | 0004 | c466 | 2400 | 0001 | 0000 | dcf4 | 0004 | c48b | a000 | 000c |
| 1333420 | 0000 | 0044 | 0004 | c49b | a000 | 0008 | 0000 | 0048 | 0000 | 0000 | 4400 | 002c | 0000 | dcf4 | 0004 | c4ab | 4000 | 0008 | 0000 | 0019 | 0000 | 0000 | 4400 | 002c |
| 1333500 | 0000 | dd04 | 0004 | c4bb | 8000 | 0008 | ffff | fffc | 0000 | 0000 | c000 | 0002 | 0000 | 0304 | 0004 | c4c7 | 8000 | 0000 | 0000 | 0000 | 0000 | 0000 | 4400 | 002e |
| 1333560 | 0000 | dd04 | 0004 | c4d4 | 8000 | 0000 | 0000 | 0000 | 0000 | 0000 | 4400 | 002f | 0000 | dd04 | 0004 | c4e1 | 8000 | 0000 | 0000 | 0000 | 0000 | 0000 | 4400 | 0030 |
| 1333640 | 0000 | dd04 | 0000 | 0000 | 4400 | 002d | 0000 | dd04 | 0000 | 0000 | 4400 | 002e | 0000 | dd20 | 0000 | 0000 | 4400 | 002d | 0000 | dda8 | 0000 | 0000 | e000 | 0002 |
| 1333720 | 0000 | 03dc | 0000 | 0000 | 4400 | 002f | 0000 | dddc | 0004 | c4eb | 8000 | 0000 | 0000 | 0000 | 0004 | c50e | 2400 | 0001 | 0000 | ddec | 0004 | c527 | a000 | 000c |
| 1334000 | 0000 | 0044 | 0004 | c537 | a000 | 0001 | 0000 | 0048 | 0000 | 0000 | 4400 | 0033 | 0000 | ddec | 0004 | c544 | 4000 | 000c | 0000 | 0018 | 0000 | 0000 | 4400 | 0033 |

```
1334060 0000 ddfc 0004 c554 8000 0000 0000 0000 0004 c561 8000 0000 0000 0000 0000 0000 4400 0034 0000 ddfc 0000 0000 4400 0035
1334140 0000 de0c 0004 c56b 8000 0008 ffff fffc 0000 0000 c000 0004 0000 0430 0004 c577 8000 0000 0000 0000 0000 0000 4400 0037
1334220 0000 de30 0000 0000 4400 0036 0000 de30 0000 0000 4400 0037 0000 de48 0000 0000 4400 0036 0000 de78 0000 0000 e000 0004
1334300 0000 04ac 0000 0000 4400 003a 0000 deac 0004 c581 8000 0000 0000 0000 0004 c598 2400 0001 0000 debc 0004 c5b9 8400 0000
1334360 0000 debc 0000 0000 4400 023b 0000 debc 0000 0000 4400 023b 0000 dec8 0000 0000 4400 023c 0000 ded8 0004 c5d5 2400 0001
1334440 0000 dee8 0000 0000 4400 023b 0000 dee8 0000 0000 4400 023b 0000 def4 0000 0000 4400 023c 0000 df08 0004 c5f5 2000 0008
1334520 0000 0000 0004 c61e 2000 0008 0000 0000 0004 c658 2400 0004 0000 df18 0004 c670 a000 000c 0000 0044 0004 c680 a000 0001
1334600 0000 0048 0004 c691 8400 0000 0000 df18 0000 0000 4400 001f 0000 df18 0000 0000 4400 001f 0000 df2c 0004 c6a3 8000 0000
1334660 0000 0000 0004 c6b0 8000 0000 0000 0000 0000 0000 4400 0020 0000 df2c 0000 0000 4400 001e 0000 df2c 0004 c6be 8000 0000
1334740 0000 0000 0004 c6d4 2400 0004 0000 df48 0004 c6f1 a000 000c 0000 0044 0004 c701 a000 000c 0000 0048 0000 0000 4400 001d
1335020 0000 df48 0000 0000 4400 001d 0000 df5c 0004 c712 8000 0000 0000 0000 0004 c71f 8000 0000 0000 0000 0000 0000 4400 001e
1335100 0000 df5c 0004 c72d 9000 0000 0000 0000 0000 0000 4400 001f 0000 df5c 0000 000c 4400 001c 0000 df5c 0004 c73a 8000 0000
1335160 0000 0000 0004 c755 2400 0008 0000 df78 0004 c770 a000 000c 0000 0044 0004 c780 a000 0001 0000 0048 0000 0000 4400 001c
1335240 0000 df8c 0004 c791 8000 0000 0000 0000 0004 c79e 8000 0000 0000 0000 0000 0000 4400 001d 0000 df8c 0000 0000 4400 001b
1335320 0000 df8c 0004 c7ac 8000 0000 0000 0000 0004 c7c4 2400 0008 0000 dfa9 0004 c7e6 a000 000c 0000 0044 0004 c7f6 a000 0008
1335400 0000 0048 0000 0000 4400 001b 0000 dfbc 0004 c807 8000 0000 0000 0000 0004 c814 8000 0000 0000 0000 0000 0000 4400 001c
1335460 0000 dfbc 0000 0000 4400 001a 0000 dfbc 0004 c822 8000 0000 0000 0000 0004 c841 2400 0001 0000 dfd8 0004 c85e a000 000c
1335540 0000 0044 0004 c876 a000 0001 0000 0048 0004 c883 8400 0000 0000 dfd8 0000 0000 4400 0012 0000 dfd8 0004 c8b7 4000 000c
1335620 0000 0018 0000 0000 4400 0012 0000 dfe8 0004 c8c7 8000 0000 0000 0000 0004 c8d4 8000 0000 0000 0000 0000 0000 4400 0013
1335700 0000 dfe8 0000 0000 4400 0011 0000 dfe8 0000 0000 4400 0012 0000 e00c 0000 0000 4400 0013 0000 e040 0004 c8de 8000 0000
1335760 0000 0000 0004 c9f9 2400 0004 0000 e050 0004 c91a a000 0004 0000 0044 0004 c932 a000 0004 0000 0048 0004 c943 8400 0000
1336040 0000 e050 0000 0000 4400 0015 0000 e050 0000 0000 4400 0015 0000 e064 0004 c975 8000 0000 0000 0000 0004 c982 8000 0000
1336120 0000 0000 0000 0000 4400 0016 0000 e064 0000 0000 4400 0014 0000 e064 0004 c990 8000 0000 0000 0000 0004 c9af 0400 0000
1336200 0000 e080 0004 c9b7 0600 0000 0003 de7c 0004 c9c0 0800 0000 0004 9514 0004 c9cc 0600 0000 0003 de88 0004 c9d8 0600 0000
1336260 0003 de50 0004 c9e5 0400 0000 0001 0dac 0004 c9f1 0800 0000 0004 98c8 0004 c9fb 0600 0000 0003 de9c 0004 ca05 0400 0000
1336340 0001 135c 0004 ca0e 0600 0000 0003 de90 0004 ca18 0800 0000 0004 9518 0004 ca21 0800 0000 0004 9b64 0004 ca28 0600 0000
1336420 0003 de94 0004 ca2e 0600 0000 0003 de08 0004 ca38 0600 0000 0003 ddc8 0004 ca42 0600 0000 0003 dd0c 0004 ca4c 0600 0000
1336500 0003 dccc 0004 ca56 0600 0000 0003 dc9c 0004 ca60 0800 0000 0004 9b60 0004 ca6a 0800 0000 0004 9b68 0004 ca74 0600 0000
1336560 0003 de90 0004 ca7e 0400 0000 0001 1e50 0004 ca87 0800 0000 0004 9948 0004 ca91 0400 0000 0001 1a5c 0004 caa2 0400 0000
1336640 0001 21cc 0004 caad 0600 0000 0003 dea8 0004 cab8 0600 0000 0003 de8c 0004 cac2 0400 0000 0001 1b8c 0004 cacc 0600 0000
1336720 0003 dea4 0004 cad6 0600 0000 0003 dd8c 0004 cadd 0600 0000 0003 deb4 0004 cae7 0800 0000 0004 95a0 0004 caef 0800 0000
1337000 0004 994c 0004 caf6 0800 0000 0004 9b54 0004 cb02 0600 0000 0003 dd4c 0004 cb0d 0600 0000 0003 dc50 0004 cb14 0800 0000
1337060 0004 9404 0004 cb1c 0800 0000 0004 9950 0004 cb23 0800 0000 0004 9b50 0004 cb2a 0600 0000 0003 deac 0004 cb2f 0800 0000
1337140 0004 98c4 0004 cb37 0800 0000 0004 948c 0004 cb3e 0400 0000 0000 f840 0004 cb49 0600 0000 0003 dec4 0004 cb57 0400 0000
1337220 0001 0930 0004 cb66 0600 0000 0003 de98 0004 cb6f 0400 0000 0001 12cc 0004 cb78 0600 0000 0003 de84 0004 cb80 0800 0000
1337300 0004 9b5c 0004 cb9c 0800 0000 0004 92f4 0004 cb95 0800 0000 0004 937c 0004 cb9e 0600 0000 0003 dea0 0004 cbaa 0400 0000
1337360 0001 2014 0004 cbb9 0800 0000 0004 92f0 0004 cbbf 0800 0000 0004 9b58 0004 cbcc 6400 0000 0000 e080 0004 cbf3 6400 0000
1337440 0000 e080 0004 cbfb 8000 0000 0000 0000 0004 cc25 8000 0000 0000 0000 0004 cc3f 8000 0000 0000 0000 0004 cc6a 8000 0000
1337520 0000 0000 0004 cc8c 8000 0000 0000 0000 0004 ccaf 8000 0000 0000 0000 0004 ccd5 8000 0000 0000 0000 0004 ccf7 8000 0000
1337600 0000 0000 0004 cd18 8000 0000 0000 0000 0004 cd31 8000 0000 0000 0000 0004 cd4c 8000 0000 0000 0000 0004 cd60 8000 0000
1337660 0000 0000 0004 c172 2600 0001 0003 dc50 0004 c193 c200 0000 0000 0ff2 0004 cda8 8200 0000 0000 03a3 0004 cdbf 8000 0001
1337740 ffff fb05 0000 0000 a200 0000 0000 0000 0004 cdd5 8200 0000 0000 1cb4 0004 cde0 8400 0000 0000 e080 0004 cdeb 2600 0001
1340020 0003 dc8c 0004 ce0e 8000 0010 ffff fb05 0004 ce77 8000 0010 ffff fb05 0000 0000 a200 0000 0000 0000 0004 ce87 8200 0000
1340100 0000 0786 0004 ce92 8400 0000 0000 e080 0004 ce9d 2600 0001 0003 dccc 0000 0000 a200 0000 0000 0000 0004 cec0 8200 0000
1340160 0000 07ce 0004 cecb 8400 0000 0000 e080 0004 ced6 2600 0001 0003 dd0c 0000 0000 a200 0000 0000 0000 0004 cef9 8200 0000
1340240 0000 1a14 0004 cf05 8400 0000 0000 e080 0004 cf11 2600 0001 0003 dd4c 0004 cf22 8200 0000 0000 2772 0004 cf44 8400 0000
1340320 0000 e080 0004 cf66 2600 0001 0003 dd8c 0004 cf74 8000 0001 ffff fb05 0004 cff6 8000 0004 ffff fb05 0004 d005 8000 0004
1340400 ffff fb05 0004 d034 8000 0004 ffff fb05 0000 0000 a200 0000 0000 0000 0004 d054 2000 0004 0000 0000 0004 d069 2000 0004
1340460 0000 0000 0004 d079 2000 0004 0000 0000 0000 0000 a200 0000 0000 0000 0004 d098 8200 0000 0000 4830 0004 d0a3 8400 0000
1340540 0000 e080 0004 d0ae 2600 0001 0003 ddc8 0004 d0be 8000 0004 ffff fb05 0004 d0e6 8000 0004 ffff fb05 0004 d0f5 8000 0004
1340620 ffff fb05 0004 d11d 8000 0004 ffff fb05 0004 d12b 8000 0008 ffff fb05 0004 d162 8000 0008 ffff fb05 0004 d170 8000 0014
1340700 ffff fb05 0004 d214 8000 0014 ffff fb05 0004 d224 2000 0004 0000 0000 0004 d233 2000 0004 0000 0000 0004 d244 2000 0004
1340760 0000 0000 0004 d254 2000 0004 0000 0000 0000 0000 a200 0000 0000 0000 0004 d265 8200 0000 0000 e088 0004 d270 8400 0000
1341040 0000 e080 0004 d27b 2600 0001 0003 de08 0004 d29e 8000 000c ffff fb05 0004 d2f7 8000 000c ffff fb05 0004 d30b 8000 0010
1341120 ffff fb05 0004 d388 8000 0010 ffff fb05 0004 d39c 8000 0018 ffff fb05 0004 d46b 8000 0018 ffff fb05 0004 d47d 8000 0018
```

```
1341200 ffff fb05 0004 d52e 8000 0018 ffff fb05 0004 d541 8000 0020 ffff fb05 0004 d609 8000 0020 ffff fb05 0004 d61a 8000 0014
1341260 ffff fb05 0004 d6ac 8000 0014 ffff fb05 0004 d6bd 8000 0020 ffff fb05 0004 d765 8000 0020 ffff fb05 0004 d79b 8000 0020
1341340 ffff fb05 0004 d7ad 8000 0008 ffff fb05 0004 d7e7 8000 0008 ffff fb05 0004 d7fc 8000 0010 ffff fb05 0004 d87d 8000 0010
1341420 ffff fb05 0000 0000 a200 0000 0000 0000 0004 d891 2000 0010 0000 0000 0004 d8ac 8400 0000 0000 e080 0004 d8b4 2000 0001
1341500 0000 0000 0004 d8c4 2600 0004 0003 de50 0004 d8d7 2000 0001 0000 0000 0004 d8e5 2000 0002 0000 0000 0004 d8f4 2000 0002
1341560 0000 0000 0004 d902 2000 0001 0000 0000 0004 d90e 2000 0001 0000 0000 0004 d91a 2000 0001 0000 0000 0004 d926 2000 0001
1341640 0000 0000 0004 d933 2000 0001 0000 0000 0004 d940 2000 0004 0000 0000 0004 d950 2000 0004 0000 0000 0004 d960 2000 0001
1341720 0000 0000 0004 d970 2000 0001 0000 0000 0004 d980 2800 0001 0004 92f0 0004 d98c 2800 0001 0004 92f4 0004 d9b0 2800 0001
1342000 0004 937c 0004 d9c0 2800 0001 0004 9404 0004 d9cf 2800 0001 0004 948c 0004 d9dd 2800 0001 0004 9514 0004 d9ef 2800 0001
1342060 0004 9518 0004 d9ff 2600 0004 0003 de7c 0004 da0e 2600 0004 0003 de80 0004 da1e 2600 0004 0003 de84 0004 da2c 2600 0004
1342140 0003 de88 0004 da3e 2600 0004 0003 de8c 0004 da4e 2600 0004 0003 de90 0004 da5e 2600 0004 0003 de94 0004 da6a 2600 0004
1342220 0003 de98 0004 da79 2800 0001 0004 95a0 0004 da9c 2800 0014 0004 98c4 0004 daaa 2800 0001 0004 98c8 0004 dacf 2800 0004
1342300 0004 9948 0004 dadf 2800 0001 0004 994c 0004 daec 2600 0001 0003 de9c 0004 dafc 2600 0001 0003 dea0 0004 db0e 2600 0001
1342360 0003 dea4 0004 db1e 2600 0004 0003 dea8 0004 db30 2800 0001 0004 9950 0004 db52 2800 0001 0004 9b50 0004 db5f 2600 0001
1342440 0003 deac 0004 db6a 2800 0004 0004 9b54 0004 db7c 2800 0004 0004 9b58 0004 db8f 2800 0004 0004 9b5c 0004 dba1 2800 0001
1342520 0004 9b60 0004 dbb1 2000 0001 0000 0000 0004 dbc1 2600 0002 0003 deb4 0004 dbe4 2800 0002 0004 9b64 0004 dbf1 2800 0001
1342600 0004 9b68 0004 dc15 2000 0004 0000 0000 0004 dc24 2000 0001 0000 0000 0004 dc33 2000 0001 0000 0000 0004 dc43 2000 0004
1342660 0000 0000 0004 dc51 2000 0004 0000 0000 0004 dc5f 2000 0004 0000 0000 0004 dc6d 2000 0004 0000 0000 0004 dc7c 2000 0004
1342740 0000 0000 0004 dc8b 2000 0004 0000 0000 0004 dc9a 2000 0004 0000 0000 0004 dca9 2000 0004 0000 0000 0004 dcb9 2000 0014
1343020 0000 0000 0004 dcc8 2400 0004 0000 e080 0004 dcd6 a000 0001 0000 0044 0004 dce2 a000 0001 0000 0048 0000 0000 4400 00b4
1343100 0000 e080 0000 0000 4400 00b4 0000 e094 0000 0000 4400 00b9 0000 e094 0000 0000 4400 00ba 0000 e0b8 0000 0000 4400 00be
1343160 0000 e0c4 0000 0000 4400 00bf 0000 e0d0 0004 dcee 2400 0004 0000 e0e0 0000 0000 4400 00c8 0000 e0e0 0000 0000 4400 00c8
1343240 0000 e0ec 0000 0000 4400 00ca 0000 e0ec 0000 0000 4400 00cb 0000 e108 0000 0000 4400 00cc 0000 e114 0000 0000 4400 00cd
1343320 0000 e120 0004 dcfd 2400 0014 0000 e130 0004 dd0c a000 0001 0000 0044 0004 dd18 a000 0001 0000 0048 0004 dd24 a000 0001
1343400 0000 004c 0004 dd34 a000 0001 0000 0050 0000 0000 4400 00d7 0000 e130 0000 0000 4400 00d7 0000 e14c 0004 dd44 8000 0004
1343460 ffff fffc 0000 0000 c000 0002 0000 00cc 0000 0000 4400 00dd 0000 e14c 0000 0000 4400 00de 0000 e160 0000 0000 4400 00e0
1343540 0000 e188 0000 0000 4400 00e1 0000 e1a0 0000 0000 4400 00e2 0000 e1b4 0000 0000 4400 00e6 0000 e1c0 0000 0000 4400 00eb
1343620 0000 e1d4 0000 0000 4400 00ef 0000 e1e4 0000 0000 4400 00f1 0000 e1f8 0000 0000 4400 00f2 0000 e20c 0000 0000 4400 00f3
1343700 0000 e220 0000 0000 4400 00ef 0000 e234 0000 0000 4400 00f5 0000 e248 0000 0000 4400 00f6 0000 e250 0000 0000 4400 00f8
1343760 0000 e258 0000 0000 4400 00f9 0000 e268 0000 0000 4400 00fb 0000 e280 0000 0000 4400 00fc 0000 e298 0000 0000 4400 00fe
1344040 0000 e2b0 0000 0000 4400 00ff 0000 e2c8 0000 0000 4400 0100 0000 e2dc 0000 0000 4400 0102 0000 e314 0000 0000 4400 0103
1344120 0000 e32c 0000 0000 4400 0105 0000 e344 0000 0000 4400 0106 0000 e358 0000 0000 4400 0105 0000 e36c 0000 0000 4400 0107
1344200 0000 e380 0000 0000 4400 0108 0000 e388 0000 0000 4400 010c 0000 e398 0000 0000 4400 0110 0000 e3a4 0000 0000 e000 0002
1344260 0000 0334 0000 0000 4400 0111 0000 e3b4 0004 dd4c 2400 0004 0000 e3c4 0004 dd58 a000 0001 0000 0044 0004 dd62 a000 0001
1344340 0000 0048 0000 0000 4400 011b 0000 e3c4 0000 0000 4400 011b 0000 e3d8 0000 0000 4400 011d 0000 e3d8 0000 0000 4400 011e
1344420 0000 e3f0 0000 0000 4400 0120 0000 e420 0000 0000 4400 0121 0000 e428 0004 dd6c 2400 0004 0000 e438 0000 0000 4400 0128
1344500 0000 e438 0000 0000 4400 0128 0000 e444 0000 0000 4400 0129 0000 e444 0000 0000 4400 012a 0000 e44c 0000 0000 4400 012b
1344560 0000 e468 0000 0000 4400 012d 0000 e474 0000 0000 4400 012e 0000 e47c 0000 0000 4400 0130 0000 e48c 0000 0000 4400 0131
1344640 0000 e498 0004 dd7c 2400 0004 0000 e4a8 0000 0000 4400 013b 0000 e4a8 0000 0000 4400 013b 0000 e4b4 0004 dd89 8000 0004
1344720 ffff fffc 0000 0000 c000 0002 0000 0434 0000 0000 4400 013e 0000 e4b4 0000 0000 4400 0140 0000 e4c8 0000 0000 4400 0141
1345000 0000 e4d4 0000 0000 4400 0145 0000 e4e8 0000 0000 4400 0146 0000 e550 0000 0000 4400 0148 0000 e564 0000 0000 e000 0002
1345060 0000 04f0 0000 0000 4400 0149 0000 e570 0004 dd91 2400 0004 0000 e580 0000 0000 4400 014e 0000 e580 0000 0000 4400 014e
1345140 0000 e58c 0004 dda3 2400 0004 0000 e5b0 0004 ddb3 a000 0004 0000 0044 0000 0000 4400 0158 0000 e5b0 0000 0000 4400 0158
1345220 0000 e5d4 0004 ddcd 8000 0001 ffff fffc 0004 ddd6 8000 0001 ffff fff8 0000 0000 c000 0002 0000 0554 0000 0000 4400 015c
1345300 0000 e5d4 0000 0000 4400 015d 0000 e5fc 0000 0000 4400 015e 0000 e604 0000 0000 4400 015f 0000 e60c 0000 0000 4400 0160
1345360 0000 e620 0000 0000 4400 0161 0000 e634 0000 0000 4400 0162 0000 e650 0000 0000 4400 0163 0000 e660 0000 0000 4400 0164
1345440 0000 e678 0000 0000 4400 0166 0000 e6a4 0000 0000 e000 0002 0000 063c 0000 0000 4400 0169 0000 e6bc 0004 dde0 2400 0001
1345520 0000 e6cc 0004 ddee a000 0004 0000 0644 0000 0000 4400 0174 0000 e6cc 0000 0000 4400 0174 0000 e6dc 0004 ddf7 8000 0004
1345600 ffff fffc 0000 0000 c000 0002 0000 065c 0000 0000 4400 0177 0000 e6dc 0000 0000 4400 0178 0000 e6f0 0000 0000 4400 0179
1345660 0000 e704 0000 0000 4400 017a 0000 e70c 0000 0000 4400 017b 0000 e744 0000 0000 4400 017c 0000 e750 0000 0000 4400 017d
1345740 0000 e770 0000 0000 4400 017f 0000 e778 0000 0000 4400 0180 0000 e78c 0000 0000 4400 0181 0000 e7a8 0000 0000 4400 0182
1346020 0000 e7b8 0000 0000 4400 0184 0000 e7e4 0000 0000 4400 0187 0000 e908 0000 0000 4400 0188 0000 e918 0000 0000 4400 0189
1346100 0000 e940 0000 0000 4400 018a 0000 e954 0000 0000 4400 018b 0000 e960 0000 0000 4400 018d 0000 e980 0000 0000 4400 018e
1346160 0000 e988 0000 0000 4400 018f 0000 e9a0 0000 0000 4400 0190 0000 e9d8 0000 0000 4400 0191 0000 ea0c 0000 0000 4400 018e
1346240 0000 ea20 0000 0000 4400 0194 0000 ea34 0000 0000 4400 0195 0000 ea44 0000 0000 4400 0196 0000 ea58 0000 0000 4400 0197
```

```
1346320  0000 ea60 0000 0000 4400 0198 0000 ea74 0000 0000 4400 0199 0000 eaac 0000 0000 4400 019c 0000 eacc 0000 0000 4400 019d
1346400  0000 ead8 0000 0000 e000 0002 0000 0a6c 0000 0000 4400 019e 0000 eaec 0004 ddff 2400 0004 0000 eafc 0004 de10 a000 0001
1346460  0000 0044 0004 de19 a000 0004 0000 0048 0000 0000 4400 01ab 0000 eafc 0000 0000 4400 01ab 0000 eb10 0004 de28 8000 0004
1346540  ffff fffc 0000 0000 c000 0002 0000 0a90 0000 0000 4400 01ae 0000 eb10 0000 0000 4400 01b0 0000 eb34 0000 0000 4400 01b1
1346620  0000 ec44 0000 0000 4400 01b3 0000 ec58 0000 0000 4400 01b5 0000 ec6c 0000 0000 4400 01b6 0000 ec74 0000 0000 4400 01b8
1346700  0000 ec8c 0000 0000 4400 01b9 0000 ecb8 0000 0000 4400 01b6 0000 eccc 0000 0000 4400 01bc 0000 ece0 0000 0000 4400 01be
1346760  0000 ece8 0000 0000 e000 0002 0000 0c74 0000 0000 4400 01c0 0000 ecf4 0004 de30 2400 0004 0000 ed04 0004 de41 a000 0001
1347040  0000 0044 0004 de4d a000 0001 0000 0048 0000 0000 4400 01c8 0000 ed04 0000 0000 4400 01c8 0000 ed18 0004 de62 4000 0004
1347120  0000 001d 0004 de6b 4000 0004 0000 001c 0004 de74 4000 0001 0000 001b 0004 de7f 8000 0004 ffff fffc 0004 de8f 2600 0004
1347200  0003 dec0 0000 0000 c000 0002 0000 0274 0000 0000 4400 01ce 0000 ed18 0000 0000 4400 01cf 0000 ed1c 0000 0000 4400 01d0
1347260  0000 ed20 0000 0000 4400 01d1 0000 ed20 0000 0000 4400 01d2 0000 ed80 0000 0000 4400 01d3 0000 ed8c 0000 0000 4400 01d4
1347340  0000 ed94 0000 0000 4400 01d5 0000 ed9c 0000 0000 4400 01d6 0000 eda8 0000 0000 4400 01d7 0000 edb0 0000 0000 4400 01d8
1347420  0000 edc0 0000 0000 4400 01d9 0000 edcc 0000 0000 4400 01da 0000 edd0 0000 0000 4400 01db 0000 ede4 0000 0000 4400 01dc
1347500  0000 edf0 0000 0000 4400 01dd 0000 ee04 0000 0000 4400 01de 0000 ee10 0000 0000 4400 01df 0000 ee34 0000 0000 4400 01e0
1347560  0000 ee48 0000 0000 4400 01e1 0000 ee4c 0000 0000 4400 01e2 0000 ee60 0000 0000 4400 01e3 0000 ee74 0000 0000 4400 01e4
1347640  0000 ee7c 0000 0000 e000 0002 0000 0e08 0000 0000 4400 01e5 0000 ee88 0004 de9e 2400 0004 0000 ee98 0004 dead a000 0001
1347720  0000 0044 0000 0000 4400 01f1 0000 ee98 0000 0000 4400 01f1 0000 eea8 0004 deb9 8000 0004 ffff fffc 0000 0000 c000 0002
1350000  0000 0e28 0000 0000 4400 01f4 0000 eea8 0000 0000 4400 01f5 0000 eec0 0000 0000 4400 01f7 0000 f01c 0000 0000 4400 01f8
1350060  0000 f034 0000 0000 4400 01fa 0000 f03c 0000 0000 4400 01fc 0000 f050 0000 0000 4400 01fd 0000 f058 0000 0000 4400 01ff
1350140  0000 f070 0000 0000 4400 0200 0000 f0a8 0000 0000 4400 0201 0000 f0dc 0000 0000 4400 01fd 0000 f0f0 0000 0000 4400 0204
1350220  0000 f104 0000 0000 4400 0205 0000 f116 0000 0000 4400 0206 0000 f120 0000 0000 4400 0208 0000 f158 0000 0000 e000 0002
1350300  0000 10e0 0000 0000 4400 0209 0000 f160 0004 dec1 2400 0004 0000 f170 0004 ded2 a000 0001 0000 0044 0004 dede a000 0001
1350360  0000 0048 0000 0000 4400 0224 0000 f170 0000 0000 4400 0224 0000 f184 0004 dee8 8000 0004 ffff fffc 0004 def4 8000 0001
1350440  ffff fff8 0000 0000 c000 0002 0000 1104 0000 0000 4400 022a 0000 f184 0000 0000 4400 022c 0000 f19c 0000 0000 4400 022e
1350520  0000 f1b0 0000 0000 4400 022f 0000 f1b4 0000 0000 4400 0230 0000 f1d4 0000 0000 4400 0231 0000 f1ec 0000 0000 4400 022f
1350600  0000 f1f8 0000 0000 4400 0233 0000 f20c 0000 0000 4400 0234 0000 f220 0000 0000 4400 0235 0000 f25c 0000 0000 4400 0239
1350660  0000 f27c 0000 0000 4400 023a 0000 f234 0000 0000 e000 0002 0000 122c 0000 0000 4400 023d 0000 f2ac 0004 defd 2400 0004
1350740  0000 f2bc 0004 df0d a000 0004 0000 0044 0000 0000 4400 0241 0000 f2bc 0000 0000 4400 0241 0000 f2e0 0004 df27 8000 0001
1351020  ffff fffc 0004 df30 8000 0001 ffff fff8 0000 0000 c000 0002 0000 1260 0000 0000 4400 0245 0000 f2e0 0000 0000 4400 0246
1351100  0000 f2e8 0000 0000 4400 0247 0000 f2fc 0000 0000 4400 0249 0000 f30c 0000 0000 e000 0002 0000 1294 0000 0000 4400 024a
1351160  0000 f314 0004 df3b 2400 0004 0000 f324 0000 0000 4400 0253 0000 f324 0000 0000 4400 0253 0000 f330 0004 df4e 8000 0004
1351240  ffff fffc 0000 0000 c000 0002 0000 12b0 0000 0000 4400 0255 0000 f330 0000 0000 4400 0256 0000 f358 0000 0000 4400 0257
1351320  0000 f36c 0000 0000 4400 0258 0000 f380 0000 0000 4400 0257 0000 f394 0000 0000 4400 0259 0000 f3a8 0000 0000 4400 025b
1351400  0000 f3b0 0000 0000 e000 0002 0000 1338 0000 0000 4400 025c 0000 f3b8 0004 df56 2400 0004 0000 f3c8 0000 0000 4400 0265
1351460  0000 f3c8 0000 0000 4400 0265 0000 f3d4 0004 df66 8000 0004 ffff fffc 0000 0000 c000 0002 0000 1354 0000 0000 4400 0268
1351540  0000 f3d4 0000 0000 4400 026a 0000 f3f0 0000 0000 4400 026b 0000 f3f8 0000 0000 4400 026d 0000 f410 0000 0000 4400 026e
1351620  0000 f444 0000 0000 4400 026b 0000 f458 0000 0000 4400 0270 0000 f46c 0000 0000 4400 0271 0000 f584 0000 0000 4400 0274
1351700  0000 f590 0000 0000 4400 0276 0000 f5bc 0000 0000 4400 0277 0000 f5c4 0000 0000 4400 0279 0000 f5dc 0000 0000 4400 027b
1351760  0000 f5f0 0000 0000 4400 027c 0000 f628 0000 0000 4400 027f 0000 f664 0000 0000 4400 0281 0000 f698 0000 0000 4400 0277
1352040  0000 f6ac 0000 0000 4400 0285 0000 f6c0 0000 0000 4400 0286 0000 f6d8 0000 0000 4400 0287 0000 f6ec 0000 0000 4400 0289
1352120  0000 f8cc 0000 0000 4400 028b 0000 f824 0000 0000 e000 0002 0000 17b0 0000 0000 4400 028c 0000 f830 0004 df6e 2400 0004
1352200  0000 f840 0004 df7f a000 0001 0000 0044 0000 0000 4400 0296 0000 f940 0000 0000 4400 0296 0000 f850 0000 0000 4400 0297
1352260  0000 f850 0000 0000 4400 029a 0000 f858 0000 0000 4400 029b 0000 f86c 0000 0000 4400 029d 0000 f878 0000 0000 4400 029e
1352340  0000 f88c 0000 0000 4400 02a0 0000 f89c 0000 0000 4400 02a1 0000 f8b0 0000 0000 4400 02a3 0000 f8c0 0000 0000 4400 02a4
1352420  0000 f8d4 0000 0000 4400 0297 0000 f8e4 0000 0000 4400 02a6 0000 f90c 0004 df8f 2400 0004 0000 f91c 0004 df9e a000 0004
1352500  0000 0044 0004 dfad a000 0004 0000 0048 0004 dfbd a000 0001 0000 004c 0004 dfc9 a000 0001 0000 0050 0000 0000 4400 02c6
1352560  0000 f91c 0000 0000 4400 02c5 0000 f938 0004 dfd3 8000 0001 ffff fe00 0004 dfe3 8000 0001 ffff fc00 0004 dff3 8000 0004
1352640  ffff fbfc 0000 0000 c000 0002 0000 18b8 0000 0000 4400 02cb 0000 f938 0000 0000 4400 02cc 0000 f954 0000 0000 4400 02cd
1352720  0000 f968 0000 0000 4400 02ce 0000 f974 0000 0000 4400 02cf 0000 f99c 0000 0000 4400 02d1 0000 f9b4 0000 0000 4400 02d3
1353000  0000 f9c4 0000 0000 4400 02d5 0000 f9f0 0000 0000 4400 02d6 0000 fa08 0000 0000 4400 02d7 0000 fa18 0000 0000 4400 02da
1353060  0000 fb1c 0000 0000 4400 02db 0000 fb38 0000 0000 4400 02dc 0000 fb4c 0000 0000 4400 02dd 0000 fb60 0000 0000 4400 02de
1353140  0000 fb7c 0000 0000 e000 0002 0000 1b04 0000 0000 4400 02df 0000 fb84 0004 e002 2400 0004 0000 fb94 0004 e010 a000 0004
1353220  0000 0044 0000 0000 4400 02e3 0000 fb94 0000 0000 4400 02e3 0000 fbb8 0004 e02a 8000 0001 ffff fffc 0004 e033 8000 0004
1353300  ffff fff8 0004 e041 8000 0004 ffff fff4 0004 e050 8000 0001 ffff fff0 0000 0000 c000 0002 0000 1b38 0000 0000 4400 02e8
1353360  0000 fbb8 0000 0000 4400 02e9 0000 fbc0 0000 0000 4400 02ea 0000 fbd4 0000 0000 4400 02eb 0000 fbe8 0000 0000 4400 02ec
```

```
1353440 0000 1bfc 0000 0000 4400 02ee 0000 fc14 0000 0000 e000 0002 0000 1b9c 0000 0000 4400 02ef 0000 fc1c 0004 e05b 2400 0004
1353520 0000 fc2c 0004 e06a a000 0004 0000 0044 0004 e079 a000 0004 0000 0048 0004 e089 a000 0001 0000 004c 0004 e095 a000 0001
1353600 0000 0050 0000 0000 4400 030f 0000 fc2c 0000 0000 4400 030f 0000 fc48 0004 e09f 8000 0004 ffff fffc 0000 0000 c000 0002
1353660 0000 1bc8 0000 0000 4400 0312 0000 fc48 0000 0000 4400 0313 0000 fc58 0000 0000 4400 0315 0000 fc70 0000 0000 4400 0317
1353740 0000 fc84 0000 0000 4400 0318 0000 fcac 0000 0000 4400 0319 0000 fcd8 0000 0000 4400 031a 0000 fcf0 0000 0000 4400 031b
1354020 0000 fd00 0000 0000 4400 031e 0000 fd18 0000 0000 4400 0320 0000 fd28 0000 0000 4400 0321 0000 fd48 0000 0000 4400 0322
1354100 0000 fd60 0000 0000 4400 0325 0000 fd78 0000 0000 4400 0327 0000 fda4 0000 0000 4400 0328 0000 fdbc 0000 0000 4400 0329
1354160 0000 fdcc 0000 0000 4400 032b 0000 fed0 0000 0000 e000 0002 0000 1e58 0000 0000 4400 032c 0000 fed8 0004 e0ae 2400 0004
1354240 0000 fee8 0004 e0bc a000 0004 0000 0044 0000 0000 4400 0330 0000 fee8 0000 0000 4400 0330 0000 ff0c 0004 e0d6 8000 0001
1354320 ffff fffc 0004 e0df 8000 0004 ffff fff8 0004 e0ed 8000 0004 ffff fff4 0004 e0fc 8000 0001 ffff fff0 0000 0000 c000 0002
1354400 0000 1e8c 0000 0000 4400 0335 0000 ff0c 0000 0000 4400 0336 0000 ff14 0000 0000 4400 0337 0000 ff28 0000 0000 4400 0338
1354460 0000 ff3c 0000 0000 4400 0339 0000 ff50 0000 0000 4400 033b 0000 ff68 0000 0000 e000 0002 0000 1ef0 0000 0000 4400 033c
1354540 0000 ff70 0004 e107 2400 0004 0000 ffd0 0004 e115 a000 0001 0000 0044 0000 0000 4400 0346 0000 ff80 0000 0000 4400 0346
1354620 0000 ff90 0000 0000 4400 0348 0000 ff90 0000 0000 4400 034a 0000 ffa8 0000 0000 4400 034b 0000 ffc4 0000 0000 4400 034c
1354700 0000 ffd8 0000 0000 4400 034d 0000 fff8 0000 0000 4400 034f 0001 0014 0000 0000 4400 0350 0001 004c 0000 0000 4400 0354
1354760 0001 0080 0000 0000 4400 0355 0001 0098 0004 e11e 2400 0004 0001 0098 0004 e12d a000 0004 0000 0044 0000 0000 4400 035f
1355040 0001 0098 0000 0000 4400 035f 0001 00a8 0000 0000 4400 0360 0001 00a8 0000 0000 4400 0361 0001 00e4 0004 e13b 2400 0004
1355120 0001 00f4 0004 e14c a000 0004 0000 0044 0004 e159 a000 0001 0000 0048 0000 0000 4400 036c 0001 00f4 0000 0000 4400 036c
1355200 0001 0108 0004 e168 8000 0001 ffff fffc 0004 e171 8000 0004 ffff fff8 0000 0000 c000 0002 0000 2088 0000 0000 4400 0370
1355260 0001 0108 0000 0000 4400 0371 0001 011c 0000 0000 4400 0374 0001 0134 0000 0000 4400 0375 0001 0154 0000 0000 4400 0376
1355340 0001 015c 0000 0000 4400 037f 0001 016c 0000 0000 4400 0380 0001 017c 0000 0000 4400 0382 0001 018c 0000 0000 4400 0383
1355420 0001 01b0 0000 0000 4400 0382 0001 01c8 0000 0000 4400 0384 0001 01dc 0000 0000 4400 0385 0001 01ec 0000 0000 4400 0387
1355500 0001 01fc 0000 0000 4400 0388 0001 021c 0000 0000 4400 0389 0001 0238 0000 0000 4400 038a 0001 025c 0000 0000 4400 038b
1355560 0001 0274 0000 0000 4400 0389 0001 0280 0000 0000 4400 038d 0001 0294 0000 0000 4400 038f 0001 02a0 0000 0000 e000 0002
1355640 0000 2228 0000 0000 4400 0390 0001 02a8 0004 e179 2400 0004 0001 02b8 0000 0000 4400 0399 0001 02b8 0000 0000 4400 0399
1355720 0001 02c4 0004 e188 8000 0004 ffff fffc 0000 0000 c000 0002 0000 2244 0000 0000 4400 039c 0001 02c4 0000 0000 4400 039d
1356000 0001 02d8 0000 0000 4400 039e 0001 0308 0000 0000 4400 03a0 0001 0330 0000 0000 4400 03a1 0001 035c 0000 0000 4400 03a3
1356060 0001 037c 0000 0000 4400 03a5 0001 03bc 0000 0000 4400 03a6 0001 04d4 0000 0000 4400 03a8 0001 05ec 0000 0000 4400 03a9
1356140 0001 0600 0000 0000 4400 03ab 0001 0608 0000 0000 4400 03ac 0001 0614 0000 0000 4400 03ad 0001 061c 0000 0000 4400 03ae
1356220 0001 0628 0000 0000 4400 03af 0001 0640 0000 0000 4400 03b0 0001 0648 0000 0000 4400 03a9 0001 0650 0000 0000 4400 03b2
1356300 0001 066c 0000 0000 4400 03b4 0001 06c0 0000 0000 4400 03b5 0001 06f0 0000 0000 4400 03b6 0001 0708 0000 0000 4400 03b5
1356360 0001 0820 0000 0000 4400 03b7 0001 0834 0000 0000 4400 03b9 0001 0854 0000 0000 4400 03bc 0001 0860 0000 0000 e000 0002
1356440 0000 27e8 0000 0000 4400 03bd 0001 0868 0004 e190 2400 0004 0001 0878 0004 e1a0 a000 0001 0000 0044 0000 0000 4400 03c7
1356520 0001 0878 0000 0000 4400 03c7 0001 0888 0004 e1a9 8000 0004 ffff fffc 0000 0000 c000 0002 0000 2808 0000 0000 4400 03ca
1356600 0001 0888 0000 0000 4400 03cb 0001 089c 0000 0000 4400 03ca 0001 08b0 0000 0000 4400 03cc 0001 08c4 0000 0000 4400 03ce
1356660 0001 08cc 0000 0000 4400 03cf 0001 090c 0000 0000 4400 03d0 0001 0918 0000 0000 e000 0002 0000 29a0 0000 0000 4400 03d1
1356740 0001 0920 0004 e1b1 2400 0004 0001 0930 0004 e1c6 a000 0001 0000 0044 0004 e1d3 a000 0004 0000 0048 0000 0000 4400 03d6
1357020 0001 0930 0000 0000 4400 03d6 0001 0944 0004 e1e1 8000 0004 ffff fffc 0000 0000 c000 0002 0000 29c4 0000 0000 4400 03d8
1357100 0001 0944 0000 0000 4400 03d9 0001 0958 0000 0000 4400 03da 0001 0968 0000 0000 4400 03db 0001 0984 0000 0000 4400 03dc
1357160 0001 0994 0000 0000 4400 03e0 0001 09a0 0000 0000 4400 03e1 0001 09c0 0000 0000 4400 03e2 0001 09c8 0000 0000 4400 03e3
1357240 0001 09e0 0000 0000 4400 03e4 0001 09ec 0000 0000 4400 03d8 0001 09f8 0000 0000 e000 0002 0000 2980 0000 0000 4400 03e6
1357320 0001 0a00 0004 e1e9 2400 0004 0001 0a10 0004 e1f9 a000 0001 0000 0044 0000 0000 4400 03f0 0001 0a10 0000 0000 4400 03f0
1357400 0001 0a20 0004 e206 8000 0002 ffff fffe 0004 e213 8000 0002 ffff fffc 0004 e21f 8000 0002 ffff fffa 0000 0000 c000 0002
1357460 0000 29a0 0000 0000 4400 03f2 0001 0a20 0000 0000 4400 03f3 0001 0a30 0000 0000 4400 03f6 0001 0a38 0000 0000 4400 03f7
1357540 0001 0a6c 0000 0000 4400 03fb 0001 0a94 0000 0000 4400 03fc 0001 0a9c 0000 0000 4400 03fb 0001 0ad0 0000 0000 4400 03ff
1357620 0001 0aec 0000 0000 4400 0400 0001 0b1c 0000 0000 4400 0401 0001 0b38 0000 0000 4400 0404 0001 0b6c 0000 0000 4400 0405
1357700 0001 0b84 0000 0000 4400 0406 0001 0b9c 0000 0000 e000 0002 0000 2b38 0000 0000 4400 0408 0001 0bb8 0004 e227 2400 0004
1357760 0001 0bc8 0000 0000 4400 040c 0001 0bc8 0000 0000 4400 040c 0001 0bd4 0000 0000 4400 040d 0001 0bd4 0000 0000 4400 040e
1360040 0001 0bdc 0004 e238 2400 0004 0001 0bec 0004 e24a a000 0001 0000 0044 0000 0000 4400 0419 0001 0bec 0000 0000 4400 0419
1360120 0001 0bfc 0004 e253 8000 0004 ffff fffc 0000 0000 c000 0002 0000 2b7c 0000 0000 4400 041c 0001 0bfc 0000 0000 4400 041d
1360200 0001 0c04 0000 0000 4400 041f 0001 0c10 0000 0000 4400 0420 0001 0c24 0000 0000 4400 041f 0001 0c38 0000 0000 4400 0421
1360260 0001 0c4c 0000 0000 4400 0423 0001 0c54 0000 0000 4400 0425 0001 0c94 0000 0000 e000 0002 0000 2c1c 0000 0000 4400 0426
1360340 0001 0c9c 0004 e25b 2400 0004 0001 0cac 0004 e26a a000 0001 0000 0044 0000 0000 4400 0430 0001 0cac 0000 0000 4400 0430
1360420 0001 0cbc 0004 e27a 8000 0001 ffff fff8 0004 e29d 8000 0001 ffff fff0 0004 e2ae 8000 0001 ffff ffe8 0000 0000 c000 0002
1360500 0000 2c3c 0000 0000 4400 0433 0001 0cbc 0000 0000 4400 0435 0001 0cd0 0000 0000 4400 0436 0001 0cec 0000 0000 4400 0437
```

```
1360560 0001 0d08 0000 0000 4400 0438 0001 0d24 0000 0000 4400 0439 0001 0d4c 0000 0000 4400 043a 0001 0d74 0000 0000 4400 043b
1360640 0001 0d74 0000 0000 e000 0002 0000 2d1c 0000 0000 4400 043d 0001 0d9c 0004 e2c0 2400 0004 0001 0dac 0000 0000 4400 0446
1360720 0001 0dac 0000 0000 4400 0446 0001 0db8 0000 0000 4400 0447 0001 0db8 0000 0000 4400 0449 0001 0df4 0000 0000 4400 044a
1361000 0001 0df4 0000 0000 4400 044c 0001 0e1c 0000 0000 4400 044d 0001 0e38 0000 0000 4400 044e 0001 0e54 0000 0000 4400 044f
1361060 0001 0e70 0000 0000 4400 0450 0001 0e78 0000 0000 4400 0451 0001 0e80 0000 0000 4400 0453 0001 0e88 0004 e2d2 2400 0004
1361140 0001 0e98 0000 0000 4400 045c 0001 0e98 0000 0000 4400 045c 0001 0ea4 0000 0000 4400 045d 0001 0ea4 0000 0000 4400 045e
1361220 0001 0ec0 0000 0000 4400 045f 0001 0ec8 0000 0000 4400 0461 0001 0ed4 0000 0000 4400 0463 0001 0f10 0000 0000 4400 0464
1361300 0001 0f10 0000 0000 4400 0466 0001 0f38 0000 0000 4400 0468 0001 0f64 0000 0000 4400 0469 0001 0f9c 0000 0000 4400 046a
1361360 0001 0fb4 0000 0000 4400 046b 0001 0fc8 0000 0000 4400 046d 0001 0fe8 0000 0000 4400 046e 0001 0ffc 0000 0000 4400 0470
1361440 0001 101c 0000 0000 4400 0471 0001 1030 0000 0000 4400 0473 0001 1050 0000 0000 4400 0474 0001 106c 0000 0000 4400 0475
1361520 0001 1088 0000 0000 4400 0476 0001 10a4 0000 0000 4400 0477 0001 10ac 0000 0000 4400 0478 0001 10b4 0000 0000 4400 047a
1361600 0001 10bc 0000 0000 4400 047c 0001 10d0 0000 0000 4400 047e 0001 10fc 0000 0000 4400 0480 0001 111c 0000 0000 4400 0481
1361660 0001 1138 0000 0000 4400 0484 0001 1140 0000 0000 4400 0485 0001 1148 0004 e2e1 2400 0004 0001 1158 0000 0000 4400 048f
1361740 0001 1158 0000 0000 4400 048f 0001 1164 0004 e2f0 8000 0004 ffff fffc 0000 0000 c000 0002 0000 30e4 0000 0000 4400 0492
1362020 0001 1164 0000 0000 4400 0493 0001 116c 0000 0000 4400 0494 0001 1178 0000 0000 4400 0495 0001 1188 0000 0000 4400 0496
1362100 0001 1190 0000 0000 4400 0497 0001 11a0 0000 0000 4400 0499 0001 11ad 0000 0000 4400 049a 0001 11bc 0000 0000 4400 049c
1362160 0001 11e0 0000 0000 4400 049d 0001 1204 0000 0000 4400 049f 0001 1214 0000 0000 4400 04a0 0001 1228 0000 0000 4400 04a2
1362240 0001 1250 0000 0000 4400 04a3 0001 1270 0000 0000 4400 04a8 0001 1284 0000 0000 4400 04aa 0001 129c 0000 0000 4400 04ac
1362320 0001 12ac 0000 0000 e000 0002 0000 323c 0000 0000 4400 04ad 0001 12bc 0004 e2fd 2400 0004 0001 12cc 0000 0000 4400 04b0
1362400 0001 12cc 0000 0000 4400 04b0 0001 12d8 0004 e30c 8000 0004 ffff fffc 0000 0000 c000 0002 0000 3258 0000 0000 4400 04b3
1362460 0001 12d8 0000 0000 4400 04b4 0001 12dc 0000 0000 4400 04b5 0001 12f0 0000 0000 4400 04b6 0001 12f8 0000 0000 4400 04b7
1362540 0001 130c 0000 0000 4400 04b8 0001 1314 0000 0000 4400 04b9 0001 1328 0000 0000 4400 04ba 0001 1330 0000 0000 4400 04bb
1362620 0001 1340 0000 0000 e000 0002 0000 32cc 0000 0000 4400 04bc 0001 134c 0004 e31a 8000 0008 ffff fb05 0004 e35a 8000 0008
1362700 ffff fb05 0004 e36b 2600 0008 0003 dec4 0004 e380 2400 0004 0001 135c 0000 0000 4400 04c5 0001 135c 0000 0000 4400 04c5
1362760 0001 1368 0004 e38f 8000 0008 ffff fffc 0000 0000 c000 0002 0000 32e8 0000 0000 4400 04c7 0001 1368 0000 0000 4400 04c8
1363040 0001 1384 0000 0000 4400 04c7 0001 13a8 0000 0000 e000 0002 0000 333c 0000 0000 4400 04c9 0001 13bc 0004 e39a 2400 0004
1363120 0001 13cc 0004 e3ad a000 0004 0000 0044 0004 e3b9 a000 0004 0000 0048 0000 0000 4400 04ce 0001 13cc 0000 0000 4400 04ce
1363200 0001 13e0 0004 e3c6 8000 0008 ffff fffc 0000 0000 c000 0002 0000 3360 0000 0000 4400 04d0 0001 13e0 0000 0000 4400 04d1
1363260 0001 13f4 0000 0000 4400 04d2 0001 1400 0000 0000 4400 04d4 0001 1410 0000 0000 e000 0002 0000 339c 0000 0000 4400 04d5
1363340 0001 141c 0004 e3d5 2400 0004 0001 142c 0004 e3e5 a000 0004 0000 0044 0000 0000 4400 04e6 0001 142c 0000 0000 4400 04e6
1363420 0001 1450 0004 e3ff 8000 0001 ffff fffc 0004 e408 8000 0004 ffff fff8 0004 e416 8000 0004 ffff fff4 0004 e425 8000 0001
1363500 ffff fff0 0004 e430 8000 0004 ffff ffec 0004 e43d 8000 0004 ffff ffe8 0000 0000 c000 0002 0000 33d0 0000 0000 4400 04ed
1363560 0001 1450 0000 0000 4400 04ee 0001 1464 0000 0000 4400 04ef 0001 1470 0000 0000 4400 04f0 0001 1478 0000 0000 4400 04f1
1363640 0001 148c 0000 0000 4400 04f2 0001 14a0 0000 0000 4400 04f4 0001 14b4 0000 0000 4400 04f6 0001 14c0 0000 0000 4400 04f8
1363720 0001 14c8 0000 0000 4400 04f9 0001 14d8 0000 0000 4400 04fb 0001 14ec 0000 0000 4400 04fc 0001 1504 0000 0000 4400 04fd
1364000 0001 150c 0000 0000 4400 04fe 0001 1514 0000 0000 4400 04ff 0001 1520 0000 0000 4400 0500 0001 1528 0000 0000 4400 0501
1364060 0001 1538 0000 0000 4400 0503 0001 1540 0000 0000 4400 0504 0001 1554 0000 0000 4400 0506 0001 1578 0000 0000 4400 0507
1364140 0001 159c 0000 0000 4400 0509 0001 15ac 0000 0000 4400 050a 0001 15c0 0000 0000 4400 050c 0001 15e8 0000 0000 4400 050d
1364220 0001 1608 0000 0000 4400 0512 0001 161c 0000 0000 4400 0518 0001 163c 0000 0000 4400 0519 0001 1654 0000 0000 4400 051c
1364300 0001 165c 0000 0000 4400 051d 0001 166c 0000 0000 4400 051f 0001 167c 0000 0000 4400 0521 0001 1688 0000 0000 e000 0002
1364360 0000 3614 0000 0000 4400 0522 0001 1694 0004 e44c 2400 0004 0001 16a4 0004 e45c a000 0004 0000 0044 0004 e468 a000 0001
1364440 0000 0048 0004 e475 a000 0001 0000 004c 0004 e485 a000 0001 0000 0050 0004 e494 a000 0001 0000 0054 0000 0000 4400 052d
1364520 0001 16a4 0000 0000 4400 052d 0001 16c4 0000 0000 4400 052e 0001 16c4 0000 0000 4400 0530 0001 16d4 0000 0000 4400 0531
1364600 0001 16f8 0000 0000 4400 0533 0001 1710 0000 0000 4400 0534 0001 1730 0000 0000 4400 0535 0001 1750 0000 0000 4400 0536
1364660 0001 1770 0000 0000 4400 0537 0001 1790 0000 0000 4400 0538 0001 17b0 0000 0000 4400 0539 0001 17d0 0000 0000 4400 053a
1364740 0001 17f0 0000 0000 4400 053b 0001 1810 0000 0000 4400 053c 0001 1830 0000 0000 4400 053d 0001 1850 0000 0000 4400 053e
1365020 0001 1870 0000 0000 4400 053f 0001 1890 0000 0000 4400 0540 0001 18b0 0000 0000 4400 0541 0001 18c0 0000 0000 4400 0542
1365100 0001 18d8 0000 0000 4400 0543 0001 18e4 0000 0000 4400 0545 0001 18f0 0000 0000 4400 0546 0001 1904 0000-0000 4400 0547
1365160 0001 1914 0000 0000 4400 0548 0001 1928 0000 0000 4400 0549 0001 1938 0000 0000 4400 054a 0001 1940 0000 0000 4400 054b
1365240 0001 1948 0000 0000 4400 054c 0001 195c 0000 0000 4400 054e 0001 1974 0000 0000 4400 054f 0001 1988 0000 0000 4400 0550
1365320 0001 19b0 0000 0000 4400 0551 0001 19b0 0000 0000 4400 0553 0001 19e0 0000 0000 4400 0554 0001 19e0 0000 0000 4400 0556
1365400 0001 1a18 0000 0000 4400 0557 0001 1a18 0000 0000 4400 055a 0001 1a44 0000 0000 4400 055b 0001 1a4c 0004 e4a0 2400 0004
1365460 0001 1a5c 0004 e4b7 a000 0001 0000 0044 0004 e4c7 a000 0001 0000 0048 0000 0000 4400 055f 0001 1a5c 0000 0000 4400 055f
1365540 0001 1a70 0004 e4d6 8000 0001 ffff ffd8 0004 e4f5 8000 0001 ffff ffb0 0000 0000 c000 0002 0000 39f0 0000 0000 4400 0562
1365620 0001 1a70 0000 0000 4400 0563 0001 1ab4 0000 0000 4400 0564 0001 1ae4 0000 0000 4400 0565 0001 1af0 0000 0000 4400 0566
```

```
1365700 0001 1b0c 0000 0000 4400 0567 0001 1b1c 0000 0000 4400 0568 0001 1b2c 0000 0000 4400 0569 0001 1b3c 0000 0000 4400 056a
1365760 0001 1b3c 0000 0000 4400 056b 0001 1b5c 0000 0000 4400 056c 0001 1b70 0000 0000 e000 0002 0000 3afc 0000 0000 4400 056d
1366040 0001 1b7c 0004 e501 2400 0004 0001 1b8c 0000 0000 4400 0570 0001 1b8c 0000 0000 4400 0570 0001 1b98 0004 e511 8000 0001
1366120 ffff fffc 0000 0000 c000 0002 0000 3b18 0000 0000 4400 0573 0001 1b98 0000 0000 4400 0574 0001 1ba0 0000 0000 4400 0575
1366200 0001 1ba8 0000 0000 4400 0576 0001 1bb4 0000 0000 4400 0577 0001 1bc8 0000 0000 4400 0578 0001 1bd8 0000 0000 4400 0579
1366260 0001 1be8 0000 0000 4400 057a 0001 1bfc 0000 0000 4400 057b 0001 1c0c 0000 0000 4400 057d 0001 1c1c 0000 0000 4400 057e
1366340 0001 1c2c 0000 0000 4400 057f 0001 1c50 0000 0000 4400 0580 0001 1c68 0000 0000 4400 0581 0001 1c74 0000 0000 4400 0582
1366420 0001 1c88 0000 0000 4400 0583 0001 1ca0 0000 0000 4400 0587 0001 1cb4 0000 0000 4400 0588 0001 1ccc 0000 0000 4400 0589
1366500 0001 1ce0 0000 0000 4400 058a 0001 1cf8 0000 0000 4400 058b 0001 1d0c 0000 0000 4400 058c 0001 1d24 0000 0000 4400 058d
1366560 0001 1d34 0000 0000 4400 058e 0001 1d4c 0000 0000 4400 058f 0001 1d60 0000 0000 4400 0590 0001 1d78 0000 0000 4400 0591
1366640 0001 1d8c 0000 0000 4400 0592 0001 1da4 0000 0000 4400 0593 0001 1db4 0000 0000 4400 0595 0001 1dcc 0000 0000 4400 057e
1366720 0001 1de4 0000 0000 4400 0598 0001 1df8 0000 0000 4400 0599 0001 1e0c 0000 0000 4400 059a 0001 1e18 0000 0000 4400 059b
1367000 0001 1e30 0000 0000 e000 0002 0000 3dc0 0000 0000 4400 059c 0001 1e40 0004 e51b 2400 0004 0001 1e50 0000 0000 4400 059f
1367060 0001 1e50 0000 0000 4400 059f 0001 1e5c 0004 e52a 8000 0004 ffff fffc 0000 0000 c000 0002 0000 3ddc 0000 0000 4400 05a2
1367140 0001 1e5c 0000 0000 4400 05a3 0001 1e70 0000 0000 4400 05a4 0001 1e7c 0000 0000 4400 05a5 0001 1e94 0000 0000 4400 05a6
1367220 0001 1ef4 0000 0000 4400 05a7 0001 1f24 0000 0000 4400 05a8 0001 1f34 0000 0000 4400 05a9 0001 1f90 0000 0000 4400 05ab
1367300 0001 1f9c 0000 0000 4400 05ac 0001 1ff8 0000 0000 e000 0002 0000 3f84 0000 0000 4400 05ad 0001 2004 0004 e533 2400 0004
1367360 0001 2014 0004 e548 a000 0004 0000 0044 0004 e556 a000 0004 0000 0048 0000 0000 4400 05b1 0001 2014 0000 0000 4400 05b1
1367440 0001 2028 0004 e567 8000 0014 ffff fffc 0004 e570 8000 0004 ffff fff8 0000 0000 c000 0002 0000 3fa8 0000 0000 4400 05b5
1367520 0001 2028 0000 0000 4400 05b6 0001 2078 0000 0000 4400 05b7 0001 20c0 0000 0000 4400 05b8 0001 20c8 0000 0000 4400 05b9
1367600 0001 20e4 0000 0000 4400 05ba 0001 20f4 0000 0000 4400 05bb 0001 20fc 0000 0000 4400 05bc 0001 210c 0000 0000 4400 05be
1367660 0001 2128 0000 0000 4400 05bf 0001 2138 0000 0000 4400 05c0 0001 214c 0000 0000 4400 05c1 0001 2160 0000 0000 4400 05c3
1367740 0001 216c 0000 0000 4400 05c4 0001 2180 0000 0000 e000 0002 0000 4110 0000 0000 4400 05c6 0001 2190 0004 e582 2400 0004
1370020 0001 21a0 0004 e592 a000 0004 0000 0044 0000 0000 4400 05cb 0001 21a0 0000 0000 4400 05cb 0001 21b0 0000 0000 4400 05cc
1370100 0001 21b0 0000 0000 4400 05cd 0001 21bc 0004 e59c 2400 0004 0001 21cc 0000 0000 4400 05d1 0001 21cc 0000 0000 4400 05d1
1370160 0001 21d8 0004 e5ad 8000 0004 ffff fffc 0000 0000 c000 0002 0000 4158 0000 0000 4400 05d4 0001 21d8 0000 0000 4400 05d5
1370240 0001 21fc 0000 0000 4400 05d4 0001 2244 0000 0000 e000 0002 0000 41d8 0000 0000 4400 05d7 0001 2258 0004 e5b5 2400 0004
1370320 0001 2263 0000 0000 4400 05e1 0001 2268 0000 0000 4400 05e1 0001 2274 0000 0000 4400 05e3 0001 2274 0000 0000 4400 05e4
1370400 0001 2274 0000 0000 4400 05e5 0001 22c0 0004 e5ca 2400 0004 0001 22d0 0004 e5dc a000 0001 0000 0044 0004 e5ea a000 0001
1370460 0000 0048 0004 e5f7 a000 0001 0000 004c 0000 0000 4400 05e9 0001 22d0 0000 0000 4400 05e9 0001 22e8 0000 0000 4400 05ec
1370540 0001 22e8 0000 0000 4400 05ee 0001 2340 0000 0000 4400 05ef 0001 2344 0000 0000 4400 05f0 0001 234c 0000 0000 4400 05f2
1370620 0001 2358 0004 e606 2400 0004 0001 2366 0000 0000 4400 05fb 0001 2368 0000 0000 4400 05fb 0001 2374 0000 0000 4400 05fd
1370700 0001 2374 0000 0000 4400 05fe 0001 238c 0000 0000 4400 0600 0001 2398 0000 0000 4400 0601 0001 23ec 0000 0000 4400 0603
1370760 0001 23f8 0000 0000 4400 0604 0001 2464 0000 0000 4400 0605 0001 2470 0000 0000 4400 0606 0001 247c 0004 e615 2400 0004
1371040 0001 248c 0004 e626 a000 0001 0000 0044 0004 e635 a000 0001 0000 0048 0000 0000 4400 0610 0001 248c 0000 0000 4400 0610
1371120 0001 24a0 0004 e645 8000 0001 ffff fffc 0004 e64f 8000 0001 ffff fff8 0000 0000 c000 0002 0000 4420 0000 0000 4400 0613
1371200 0001 24a0 0000 0000 4400 0614 0001 2434 0000 0000 4400 0615 0001 24f4 0000 0000 4400 0614 0001 2500 0000 0000 4400 0616
1371260 0001 2514 0000 0000 e000 0002 0000 44a8 0000 0000 4400 0617 0001 2528 0004 e659 2400 0004 0001 2538 0000 0000 4400 0621
1371340 0001 2538 0000 0000 4400 0621 0001 2544 0004 e66a 8000 0004 ffff fffc 0000 0000 c000 0002 0000 44c4 0000 0000 4400 0624
1371420 0001 2544 0000 0000 4400 0625 0001 2564 0000 0000 4400 0627 0001 2580 0000 0000 4400 0629 0001 2598 0000 0000 4400 062a
1371500 0001 25cc 0000 0000 4400 0627 0001 25e0 0000 0000 4400 062c 0001 25f4 0000 0000 4400 062d 0001 270c 0000 0000 4400 0630
1371560 0001 2718 0000 0000 4400 0632 0001 2744 0000 0000 4400 0634 0001 275c 0000 0000 4400 0636 0001 2770 0000 0000 4400 0637
1371640 0001 27a8 0000 0000 4400 063a 0001 27e4 0000 0000 4400 063c 0001 2818 0000 0000 4400 0632 0001 282c 0000 0000 4400 0640
1371720 0001 2840 0000 0000 4400 0641 0001 2858 0000 0000 4400 0642 0001 286c 0000 0000 4400 0644 0001 298c 0000 0000 4400 0646
1372000 0001 29a4 0000 0000 e000 0002 0000 4930 0000 0000 4400 0647 0001 29b0 0004 e672 2400 0004 0001 29c0 0000 0000 4400 064a
1372060 0001 29c0 0000 0000 4400 064a 0001 29cc 0000 0000 4400 064c 0001 29cc 0000 0000 4400 064d 0001 29dc 0000 0000 4400 064f
1372140 0001 29ec 0004 e682 c200 0000 0000 0000 0004 e697 2400 0004 0001 29fc 0004 e6a7 a000 0001 0000 0044 0000 0000 4400 0654
1372220 0001 29fc 0000 0000 4400 0654 0001 2a0c 0000 0000 4400 0655 0001 2a0c 0000 0000 4400 0656 0001 2a24 0000 0000 4400 0657
1372300 0001 2a4c 0000 0000 4400 0655 0001 2a58 0000 0000 4400 0658 0001 2a6c 0000 0000 4400 0659 0001 2a78 0004 e6b1 0400 0000
1372360 0001 2a88 0004 e6bb 0800 0000 0004 9bc4 0004 e6c5 0800 0000 0004 9f0c 0004 e6ce 0400 0000 0001 350c 0004 e6d8 0400 0000
1372440 0001 3628 0004 e6e2 0800 0000 0004 9b40 0004 e6ec 0800 0000 0004 9bd4 0004 e6f5 0400 0000 0001 39e0 0004 e6ff 0800 0000
1372520 0004 9bd8 0004 e708 0400 0000 0001 396c 0004 e70e 0600 0000 0003 e520 0004 e718 0600 0000 0003 e4e0 0004 e722 0400 0000
1372600 0001 2ac8 0004 e730 0400 0000 0001 36a8 0004 e73b 0400 0000 0001 2b98 0004 e746 0600 0000 0003 e5a0 0004 e74d 0800 0000
1372660 0004 9bbc 0004 e755 0600 0000 0003 e560 0004 e760 0600 0000 0003 e4a0 0004 e767 0800 0000 0004 9bc0 0004 e772 0800 0000
1372740 0004 9bc8 0004 e77d 0800 0000 0004 9bb8 0004 e788 0400 0000 0001 2b14 0004 e794 0800 0000 0004 9bcc 0004 e79c 0400 0000
```

```
1373020 0001 2a88 0004 e7a5 6400 0000 0001 2a88 0004 e7cc 6400 0000 0001 2a88 0004 e7d6 8000 0000 0000 0000 0004 e800 8000 0000
1373100 0000 0000 0004 e81a 8000 0000 0000 0000 0004 e845 8000 0000 0000 0000 0004 e867 8000 0000 0000 0000 0004 e88a 8000 0000
1373160 0000 0000 0004 e8b0 8000 0000 0000 0000 0004 e8d2 8000 0000 0000 0000 0004 e8f3 8000 0000 0000 0000 0004 e90c 8000 0000
1373240 0000 0000 0004 e927 8000 0000 0000 0000 0004 e93b 8000 0000 0000 0000 0004 e94d 2600 0001 0003 e4a0 0004 e96c c200 0000
1373320 0003 0ff2 0004 e983 8200 0000 0000 0786 0004 e98e 8400 0000 0001 2a88 0004 e999 2600 0001 0003 e4e0 0000 0000 a200 0000
1373400 0000 0000 0004 e9bc 8200 0000 0000 1be1 0004 e9c7 8400 0000 0001 2a88 0004 e9d2 2600 0001 0003 e520 0004 e9e3 8000 0010
1373460 ffff fb05 0004 ea53 8000 0010 ffff fb05 0000 0000 a200 0000 0000 0000 0004 ea63 8200 0000 0000 1b24 0004 ea6f 8400 0000
1373540 0001 2a88 0004 ea7b 2600 0001 0003 e560 0004 ea9f 8200 0000 0000 2882 0004 eac1 8400 0000 0001 2a88 0004 eae3 2600 0001
1373620 0003 e5a0 0004 eb03 8000 0001 ffff fb05 0004 eb85 8000 0004 ffff fb05 0004 eb94 8000 0004 ffff fb05 0004 ebc4 8000 0004
1373700 ffff fb05 0000 0000 a200 0000 0000 0000 0004 ebe4 2000 0004 0000 0000 0004 ebf9 2000 0004 0000 0000 0004 ec09 2000 0004
1373760 0000 0000 0000 0000 a200 0000 0000 0000 0004 ec28 8000 0001 ffff fb05 0004 ec36 8000 0018 ffff fb05 0004 ecbd 8000 0018
1374040 ffff fb05 0004 eccd 8000 0018 ffff fb05 0004 ecda 8000 0010 ffff fb05 0004 ed32 8000 0010 ffff fb05 0004 ed43 8000 0010
1374120 ffff fb05 0004 ed59 8000 0010 ffff fb05 0004 edb4 8000 0010 ffff fb05 0004 edc6 8000 0010 ffff fb05 0004 eddd 2000 0001
1374200 0000 0000 0004 eded 8400 0000 0001 2a98 0004 edf7 2000 0001 0000 0000 0004 ee1b 2000 0001 0000 0000 0004 ee3f 2800 0004
1374260 0004 9bb8 0004 ee50 2800 0004 0004 9bbc 0004 ee5e 2800 0004 0004 9bc0 0004 ee6f 2800 0004 0004 9bc4 0004 ee7f 2800 0004
1374340 0004 9bc8 0004 ee90 2800 0018 0004 9bcc 0004 ee9f 2800 0018 0004 9bd0 0004 eeb0 2800 0004 0004 9bd4 0004 eebf 2800 0001
1374420 0004 9bd8 0004 eeeb 2800 0001 0004 9f0c 0004 eefb 2000 0001 0000 0000 0004 ef0b 2000 0001 0000 0000 0004 ef1a 2400 0004
1374500 0001 2a88 0004 ef29 a000 0001 0000 0044 0000 0000 4400 0057 0001 2a88 0000 0000 4400 0057 0001 2a98 0000 0000 4400 0058
1374560 0001 2a98 0000 0000 4400 0059 0001 2aac 0000 0000 4400 005a 0001 2ab8 0004 ef32 2400 0004 0001 2ac8 0000 0000 4400 005d
1374640 0001 2ac8 0000 0000 4400 005d 0001 2ad4 0000 0000 4400 005e 0001 2ad4 0000 0000 4400 005f 0001 2ae8 0000 0000 4400 0060
1374720 0001 2af0 0000 0000 4400 0061 0001 2b04 0004 ef46 2400 0018 0001 2b14 0004 ef59 a000 0001 0000 0044 0000 0000 4400 0065
1375000 0001 2b14 0000 0000 4400 0065 0001 2b24 0004 ef64 8000 0018 ffff fffc 0000 0000 c000 0002 0000 009c 0000 0000 4400 0068
1375060 0001 2b24 0000 0000 4400 0069 0001 2b40 0000 0000 4400 006a 0001 2b60 0000 0000 4400 0068 0001 2b68 0000 0000 4400 006b
1375140 0001 2b7c 0000 0000 e000 0002 0000 0100 0000 0000 4400 006c 0001 2b88 0004 ef6f 2400 0004 0001 2b98 0004 ef80 a000 0004
1375220 0000 0044 0004 ef8c a000 0001 0000 0048 0004 ef96 a000 0001 0000 004c 0004 efa3 a000 0004 0000 0050 0000 0000 4400 0072
1375300 0001 2b98 0000 0000 4400 0072 0001 2bb4 0004 efb0 8000 0018 ffff fffc 0000 0000 c000 0002 0000 012c 0000 0000 4400 0075
1375360 0001 2bb4 0000 0000 4400 0076 0001 2bcc 0000 0000 4400 0077 0001 2bdc 0000 0000 4400 0078 0001 2be8 0000 0000 4400 0079
1375440 0001 2bf4 0000 0000 4400 007a 0001 2c00 0000 0000 4400 007b 0001 2c0c 0000 0000 4400 007c 0001 2c18 0000 0000 e000 0002
1375520 0000 0198 0000 0000 4400 007d 0001 2c20 0004 efbb 2400 0004 0001 2c30 0004 efcc a000 0004 0000 0044 0004 efd8 a000 0001
1375600 0000 0048 0004 efe2 a000 0001 0000 004c 0004 efef a000 0004 0000 0050 0000 0000 4400 0085 0001 2c30 0000 0000 4400 0085
1375660 0001 2c4c 0004 effc 8000 0001 ffff fffc 0000 0000 c000 0002 0000 01c4 0000 0000 4400 0088 0001 2c4c 0000 0000 4400 0089
1375740 0001 2c54 0000 0000 4400 008a 0001 2c60 0000 0000 4400 008b 0001 2c78 0000 0000 4400 008c 0001 2cd0 0000 0000 4400 008d
1376020 0001 2cf4 0000 0000 4400 008e 0001 2d08 0000 0000 4400 008f 0001 2d18 0000 0000 e000 0002 0000 02c4 0000 0000 4400 0091
1376100 0001 2d4c 0004 f006 2400 0004 0001 2d5c 0004 f01b a000 0010 0000 0044 0004 f02a a000 0010 0000 0048 0004 f03a a000 0001
1376160 0000 004c 0000 0000 4400 0099 0001 2d5c 0000 0000 4400 0099 0001 2d74 0004 f052 8000 0001 ffff fffc 0004 f05c 8000 0004
1376240 ffff fff8 0000 0000 c000 0002 0000 02ec 0000 0000 4400 009d 0001 2d74 0000 0000 4400 009e 0001 2d7c 0000 0000 4400 009f
1376320 0001 2d8c 0000 0000 4400 00a0 0001 2da0 0000 0000 4400 00a1 0001 2dc8 0000 0000 4400 00a4 0001 2ddc 0000 0000 4400 00a5
1376400 0001 2dec 0000 0000 4400 00a6 0001 2e0c 0000 0000 4400 00a7 0001 2e18 0000 0000 4400 00a8 0001 2e24 0000 0000 4400 00a9
1376460 0001 2e34 0000 0000 4400 00aa 0001 2e3c 0000 0000 4400 00ab 0001 2e48 0000 0000 4400 00ac 0001 2e6c 0000 0000 4400 00af
1376540 0001 2e80 0000 0000 4400 00b0 0001 2e90 0000 0000 4400 00b1 0001 2eb8 0000 0000 4400 00b2 0001 2f14 0000 0000 4400 00b3
1376620 0001 2f2c 0000 0000 4400 00b4 0001 2f58 0000 0000 4400 00b6 0001 2f6c 0000 0000 4400 00b7 0001 2f80 0000 0000 e000 0002
1376700 0000 0508 0000 0000 4400 00b9 0001 2f90 0004 f064 2400 0004 0001 2fa0 0004 f075 a000 0001 0000 0044 0004 f07f a000 0001
1376760 0000 0048 0000 0000 4400 00c0 0001 2fa0 0000 0000 4400 00c0 0001 2fb4 0004 f08c 8000 0018 ffff fffc 0000 0000 c000 0002
1377040 0000 052c 0000 0000 4400 00c3 0001 2fb4 0000 0000 4400 00c4 0001 2fcc 0000 0000 4400 00c5 0001 2fdc 0000 0000 4400 00c6
1377120 0001 2fe8 0000 0000 4400 00c7 0001 2ff4 0000 0000 e000 0002 0000 0578 0000 0000 4400 00c8 0001 3000 0004 f097 2400 0004
1377200 0001 3010 0004 f0a8 a000 0004 0000 0044 0004 f0b4 a000 0001 0000 0048 0000 0000 4400 00d2 0001 3010 0000 0000 4400 00d2
1377260 0001 3024 0004 f0c1 8000 0001 ffff fff0 0004 f0e2 8000 0004 ffff ffec 0004 f0ef 8000 0004 ffff ffe8 0004 f0ff 8000 0001
1377340 ffff ffe7 0004 f108 8000 0001 ffff ffe0 0004 f112 8000 0001 ffff ffdc 0004 f11e 8000 0001 ffff ffd8 0004 f129 8000 0001
1377420 ffff ffd4 0004 f134 8000 0018 ffff ffd0 0000 0000 c000 0002 0000 059c 0000 0000 4400 00d9 0001 3024 0000 0000 4400 00da
1377500 0001 302c 0000 0000 4400 00db 0001 3034 0000 0000 4400 00dc 0001 303c 0000 0000 4400 00dd 0001 3048 0000 0000 4400 00de
1377560 0001 3054 0000 0000 4400 00df 0001 306c 0000 0000 4400 00e0 0001 3078 0000 0000 4400 00e1 0001 3088 0000 0000 4400 00e6
1377640 0001 3094 0000 0000 4400 00e7 0001 30bc 0000 0000 4400 00e8 0001 30d0 0000 0000 4400 00ea 0001 30d4 0000 0000 4400 00eb
1377720 0001 3120 0000 0000 4400 00ec 0001 3138 0000 0000 4400 00ed 0001 314c 0000 0000 4400 00ee 0001 317c 0000 0000 4400 00ef
1400000 0001 316c 0000 0000 4400 00f0 0001 3198 0000 0000 4400 00f1 0001 31d0 0000 0000 4400 00f2 0001 31f4 0000 0000 4400 00f3
1400060 0001 3204 0000 0000 4400 00f4 0001 3210 0000 0000 4400 00f5 0001 321c 0000 0000 4400 00f6 0001 3238 0000 0000 4400 00f7
```

```
1400140  0001 3250 0000 0000 4400 00f8 0001 326c 0000 0000 4400 00f9 0001 3288 0000 0000 4400 00fa 0001 3294 0000 0000 4400 00fb
1400220  0001 32b0 0000 0000 4400 00fc 0001 32b4 0000 0000 4400 00fe 0001 32cc 0000 0000 4400 00ff 0001 32e0 0000 0000 4400 0101
1400300  0001 32f4 0000 0000 4400 0102 0001 3310 0000 0000 4400 0103 0001 3330 0000 0000 4400 0104 0001 333c 0000 0000 4400 0105
1400360  0001 3350 0000 0000 4400 0106 0001 3380 0000 0000 4400 0107 0001 338c 0000 0000 4400 0108 0001 339c 0000 0000 4400 0109
1400440  0001 33d0 0000 0000 4400 010a 0001 340c 0000 0000 4400 010d 0001 3418 0000 0000 4400 010e 0001 342c 0000 0000 4400 010f
1400520  0001 343c 0000 0000 4400 0110 0001 3450 0000 0000 4400 0111 0001 3460 0000 0000 4400 0113 0001 3474 0000 0000 4400 0114
1400600  0001 3484 0000 0000 4400 0115 0001 3498 0000 0000 4400 0116 0001 34a8 0000 0000 4400 0117 0001 34bc 0000 0000 4400 0118
1400660  0001 34cc 0000 0000 4400 0119 0001 34e0 0000 0000 4400 011a 0001 34e8 0000 0000 4400 011b 0001 34f0 0000 0000 e000 0002
1400740  0000 0a74 0000 0000 4400 011c 0001 34fc 0004 f13f 2400 0004 0001 350c 0000 0000 4400 011f 0001 350c 0000 0000 4400 011f
1401020  0001 3518 0004 f14f 8000 0018 ffff fffc 0004 f15a 8000 0018 ffff fff8 0000 0000 c000 0002 0000 0a90 0000 0000 4400 0122
1401100  0001 3518 0000 0000 4400 0123 0001 3534 0000 0000 4400 0124 0001 3550 0000 0000 4400 0125 0001 356c 0000 0000 4400 0123
1401160  0001 3574 0000 0000 4400 0126 0001 3588 0000 0000 4400 0127 0001 35ac 0000 0000 4400 0128 0001 35b4 0000 0000 4400 0129
1401240  0001 35c8 0000 0000 4400 012b 0001 35ec 0000 0000 4400 0122 0001 3604 0000 0000 e000 0002 0000 0b90 0000 0000 4400 012d
1401320  0001 3618 0004 f166 2400 0004 0001 3628 0000 0000 4400 0130 0001 3628 0000 0000 4400 0130 0001 3634 0004 f176 8000 0001
1401400  ffff fffc 0000 0000 c000 0002 0000 0bac 0000 0000 4400 0133 0001 3634 0000 0000 4400 0134 0001 3650 0000 0000 4400 0135
1401460  0001 3680 0000 0000 e000 0002 0000 0c10 0000 0000 4400 0137 0001 3698 0004 f180 2400 0004 0001 36a8 0004 f191 a000 0001
1401540  0000 0044 0004 f19c a000 0004 0000 0048 0000 0000 4400 013c 0001 36a8 0000 0000 4400 013c 0001 36bc 0004 f1ac 8000 0018
1401620  ffff fffc 0004 f1b5 8000 0001 ffff fff9 0004 f1d8 8000 0001 ffff fff4 0000 0000 c000 0002 0000 0c34 0000 0000 4400 0141
1401700  0001 36bc 0000 0000 4400 0142 0001 36c8 0000 0000 4400 0143 0001 36d8 0000 0000 4400 0144 0001 36e8 0000 0000 4400 0145
1401760  0001 3718 0000 0000 4400 0146 0001 3720 0000 0000 4400 0147 0001 3724 0000 0000 4400 0148 0001 3748 0000 0000 4400 0149
1402040  0001 3754 0000 0000 4400 014a 0001 3770 0000 0000 4400 0147 0001 377c 0000 0000 4400 014d 0001 3798 0000 0000 4400 014e
1402120  0001 37ac 0000 0000 4400 0150 0001 37c0 0000 0000 4400 0152 0001 37cc 0000 0000 4400 0153 0001 37f0 0000 0000 4400 0154
1402200  0001 37fc 0000 0000 4400 0155 0001 3820 0000 0000 4400 0156 0001 382c 0000 0000 4400 0158 0001 3834 0000 0000 4400 0159
1402260  0001 3848 0000 0000 4400 015a 0001 3860 0000 0000 4400 015c 0001 3868 0000 0000 4400 015d 0001 3884 0000 0000 4400 015f
1402340  0001 38bc 0000 0000 4400 0161 0001 38c0 0000 0000 4400 0162 0001 38d0 0000 0000 4400 0163 0001 38e4 0000 0000 4400 0165
1402420  0001 38ec 0000 0000 4400 0166 0001 38fc 0000 0000 4400 0167 0001 3914 0000 0000 4400 0156 0001 391c 0000 0000 4400 0169
1402500  0001 3940 0000 0000 4400 016a 0001 3950 0000 0000 e000 0002 0000 0ed4 0000 0000 4400 016b 0001 395c 0004 f1e2 2400 0004
1402560  0001 396c 0004 f1ee a000 0001 0000 0044 0000 0000 4400 016f 0001 396c 0000 0000 4400 016f 0001 397c 0004 f1fb 8000 0018
1402640  ffff fffc 0000 0000 c000 0002 0000 0ef4 0000 0000 4400 0172 0001 397c 0000 0000 4400 0173 0001 3998 0000 0000 4400 0174
1402720  0001 39b0 0000 0000 4400 0172 0001 39bc 0000 0000 e000 0002 0000 0f48 0000 0000 4400 0175 0001 39d0 0004 f206 2400 0004
1403000  0001 39e0 0004 f216 a000 0001 0000 0044 0004 f221 a000 0001 0000 0048 0000 0000 4400 0179 0001 39e0 0000 0000 4400 0179
1403060  0001 39f4 0004 f22c 8000 0001 ffff fffc 0000 0000 c000 0002 0000 0f6c 0000 0000 4400 017c 0001 39f4 0000 0000 4400 017d
1403140  0001 3a08 0000 0000 4400 017e 0001 3a10 0000 0000 4400 017f 0001 3a34 0000 0000 4400 0180 0001 3a44 0000 0000 4400 0181
1403220  0001 3a74 0000 0000 4400 0182 0001 3a84 0000 0000 4400 0183 0001 3a90 0000 0000 e000 0002 0000 1038 0000 0000 4400 0187
1403300  0001 3ac0 0004 f234 2400 0004 0001 3ad0 0004 f245 a000 0001 0000 0044 0000 0000 4400 018b 0001 3ad0 0000 0000 4400 018b
1403360  0001 3ae0 0000 0000 4400 018c 0001 3ae0 0000 0000 4400 018d 0001 3af8 0004 f250 0400 0000 0001 3b08 0004 f25a 0800 0000
1403440  0004 a248 0004 f263 0800 0000 0004 a244 0004 f26d 0600 0000 0003 e70c 0004 f277 0800 0000 0004 a24c 0004 f281 0600 0000
1403520  0003 e78c 0004 f288 0600 0000 0003 e74c 0004 f293 0600 0000 0003 e6c8 0004 f29a 0800 0000 0004 a240 0004 f2a3 6400 0000
1403600  0001 3b08 0004 f2ca 6400 0000 0001 3b08 0004 f2d4 8000 0000 0000 0000 0004 f2fe 8000 0000 0000 0000 0004 f318 8000 0000
1403660  0000 0000 0004 f343 8000 0000 0000 0000 0004 f365 8000 0000 0000 0000 0004 f388 8000 0000 0000 0000 0004 f3ae 8000 0000
1403740  0000 0000 0004 f3d0 8000 0000 0000 0000 0004 f3f1 8000 0000 0000 0000 0004 f40a 8000 0000 0000 0000 0004 f425 8000 0000
1404020  0000 0000 0004 f439 8000 0000 0000 0000 0004 f44b 2600 0001 0003 e6c8 0004 f46c c200 0000 0000 0ff2 0004 f481 8200 0000
1404100  0000 0786 0004 f48c 8400 0000 0001 3b08 0004 f497 2600 0001 0003 e70c 0000 0000 a200 0000 0000 0000 0004 f4ba 8200 0000
1404160  0000 1b24 0004 f4c6 8400 0000 0001 3b08 0004 f4d2 2600 0001 0003 e74c 0004 f4f6 8200 0000 0000 2882 0004 f518 8400 0000
1404240  0001 3b08 0004 f53a 2600 0001 0003 e78c 0004 f55a 8000 0001 ffff fb05 0004 f5dc 8000 0004 ffff fb05 0004 f5eb 8000 0004
1404320  ffff fb05 0004 f61b 8000 0004 ffff fb05 0000 0000 a200 0000 0000 0000 0004 f63b 2000 0004 0000 0000 0004 f650 2000 0004
1404400  0000 0000 0004 f660 2000 0004 0000 0000 0000 0000 a200 0000 0000 0000 0004 f67f 2000 0001 0000 0000 0004 f68c 8400 0000
1404460  0001 3b08 0004 f696 2800 0004 0004 a240 0004 f6a5 2800 0004 0004 a244 0004 f6b5 2800 0004 0004 a248 0004 f6c4 2800 0004
1404540  0004 a24c 0004 f6d4 2400 0004 0001 3b08 0000 0000 4400 0036 0001 3b08 0000 0000 4400 0036 0001 3b14 0000 0000 4400 003a
1404620  0001 3b14 0000 0000 4400 003b 0001 3b2c 0000 0000 4400 003f 0001 3b44 0000 0000 4400 0041 0001 3b58 0000 0000 4400 0042
1404700  0001 3b70 0000 0000 4400 0043 0001 3b88 0000 0000 4400 0046 0001 3b98 0000 0000 4400 0047 0001 3ba0 0004 f6e4 2400 0004
1404760  0001 3bb0 0004 f6f4 a000 0001 0000 0044 0000 0000 4400 0052 0001 3bb0 0000 0000 4400 0052 0001 3bc0 0004 f707 8000 0004
1405040  ffff fffc 0004 f715 8000 0004 ffff fff8 0004 f724 8000 0004 ffff fff4 0004 f732 8000 0008 ffff ffe8 0004 f73d 8000 0008
1405120  ffff ffe0 0004 f749 8000 0008 ffff ffd8 0004 f758 8000 0001 ffff ffcc 0000 0000 c000 0002 0000 00b8 0000 0000 4400 0057
1405200  0001 3bc0 0000 0000 4400 0058 0001 3bcc 0000 0000 4400 005a 0001 3bd8 0000 0000 4400 005b 0001 3bec 0000 0000 4400 005c
```

```
1405260  0001 3c18 0000 0000 4400 005d 0001 3c44 0000 0000 4400 005e 0001 3c64 0000 0000 4400 0060 0001 3c88 0000 0000 4400 0062
1405340  0001 3c94 0000 0000 4400 0063 0001 3ca0 0000 0000 4400 0065 0001 3cac 0000 0000 4400 0067 0001 3cc0 0000 0000 4400 006a
1405420  0001 3cc0 0000 0000 4400 006b 0001 3d3c 0000 0000 4400 006e 0001 3d4c 0000 0000 4400 006f 0001 3d68 0000 0000 4400 0071
1405500  0001 3d6c 0000 0000 e000 0002 0000 0270 0000 0000 4400 0072 0001 3d78 0004 f779 2400 0004 0001 3188 0004 f78a a000 0001
1405560  0000 0044 0000 0000 4400 007d 0001 3d88 0000 0000 4400 007d 0001 3d98 0004 f796 8000 0004 ffff fffc 0004 f7a4 8000 0004
1405640  ffff fff8 0004 f7b3 8000 0004 ffff fff4 0004 f7c1 8000 0004 ffff fff0 0004 f7cb 8000 0004 ffff ffec 0004 f7d6 8000 0004
1405720  ffff ffe8 0004 f7e4 8000 0001 ffff ffdc 0000 0000 c000 0002 0000 0290 0000 0000 4400 0082 0001 3198 0000 0000 4400 0083
1406000  0001 3da4 0000 0000 4400 0085 0001 3db0 0000 0000 4400 0086 0001 3dc4 0000 0000 4400 0087 0001 3df4 0000 0000 4400 0088
1406060  0001 3e24 0000 0000 4400 0089 0001 3e48 0000 0000 4400 008b 0001 3e78 0000 0000 4400 008d 0001 3e84 0000 0000 4400 008e
1406140  0001 3e90 0000 0000 4400 0090 0001 3e9c 0000 0000 4400 0092 0001 3eb0 0000 0000 4400 0095 0001 3eb0 0000 0000 4400 0096
1406220  0001 3f4c 0000 0000 4400 0099 0001 3f5c 0000 0000 4400 009a 0001 3f88 0000 0000 4400 009c 0001 3f8c 0000 0000 e000 0002
1406300  0000 0490 0000 0000 4400 009d 0001 3f98 0004 f7f2 2400 0004 0001 3fa8 0004 f801 a000 0001 0000 0044 0000 0000 4400 00a7
1406360  0001 3fa8 0000 0000 4400 00a7 0001 3fb8 0004 f80d 8000 0004 ffff fffc 0004 f81b 8000 0004 ffff fff8 0004 f82a 8000 0004
1406440  ffff fff4 0004 f834 8000 0004 ffff fff0 0004 f83f 8000 0004 ffff ffec 0000 0000 c000 0002 0000 04b0 0000 0000 4400 00ab
1406520  0001 3fb8 0000 0000 4400 00ac 0001 3fc4 0000 0000 4400 00ae 0001 3fd0 0000 0000 4400 00af 0001 4000 0000 0000 4400 00b0
1406600  0001 4030 0000 0000 4400 00b2 0001 4058 0000 0000 4400 00b4 0001 406c 0000 0000 4400 00b7 0001 406c 0000 0000 4400 00b8
1406660  0001 4108 0000 0000 4400 00bb 0001 4118 0000 0000 e000 0002 0000 0618 0000 0000 4400 00bc 0001 4120 0004 f84d 0400 0000
1406740  0001 4130 0004 f856 0400 0000 0001 7de8 0004 f860 0600 0000 0003 ea60 0004 f86a 0600 0000 0003 ea20 0004 f874 0600 0000
1407020  0003 e964 0004 f87e 0400 0000 0001 4130 0004 f88b 0800 0000 0004 a258 0004 f893 0600 0000 0003 e9e4 0004 f89a 0800 0000
1407100  0004 a250 0004 f8a4 0800 0000 0004 a25c 0004 f9ac 0600 0000 0003 e9a4 0004 f8b7 0600 0000 0003 e920 0004 f8be 0800 0000
1407160  0004 a254 0004 f8c9 6400 0000 0001 4130 0004 f8f0 6400 0000 0001 4130 0004 f8f9 8000 0000 0000 0000 0004 f923 8000 0000
1407240  0000 0000 0004 f93d 8000 0000 0000 0000 0004 f968 8000 0000 0000 0000 0004 f98a 8000 0000 0000 0000 0004 f9ad 8000 0000
1407320  0000 0000 0004 f9d3 8000 0000 0000 0000 0004 f9f5 8000 0000 0000 0000 0004 fa16 8000 0000 0000 0000 0004 fa2f 8000 0000
1407400  0000 0000 0004 fa4a 8000 0000 0000 0000 0004 fa5e 8000 0000 0000 0000 0004 fa70 2600 0001 0003 e920 0004 fa91 c200 0000
1407460  0000 0ff2 0004 faa6 8200 0000 0000 1cf1 0004 fab1 8400 0000 0001 4130 0004 fabc 2600 0001 0003 e964 0004 fadf 8000 0010
1407540  ffff fb05 0004 fb4f 8000 0010 ffff fb05 0000 0000 a200 c000 0000 0000 0004 fb5f 8200 0000 0000 1b24 0004 fb6b 8400 0000
1407620  0001 4130 0004 fb77 2600 0001 0003 e9a4 0004 fb9b 8200 0000 0000 2882 0004 fbbd 8400 0000 0001 4130 0004 fbdf 2600 0001
1407700  0003 e9e4 0004 fbff 8000 0001 ffff fb05 0004 fc81 8000 0004 ffff fb05 0004 fc90 8000 0004 ffff fb05 0004 fcc0 8000 0004
1407760  ffff fb05 0000 0000 a200 0000 0000 0000 0004 fce0 2000 0004 0000 0000 0004 fcf5 2000 0004 0000 0000 0004 fd05 2000 0004
1410040  0000 0000 0000 0000 a200 0000 0000 0000 0004 fd24 8200 0000 0000 4830 0004 fd2f 8400 0000 0001 4130 0004 fd3a 2600 0001
1410120  0003 ea20 0004 fd4a 8000 0004 ffff fb05 0004 fd72 8000 0004 ffff fb05 0004 fd81 8000 0004 ffff fb05 0004 fda9 8000 0004
1410200  ffff fb05 0004 fdb7 8000 0008 ffff fb05 0004 fdee 8000 0008 ffff fb05 0004 fdfc 8000 0014 ffff fb05 0004 fea0 8000 0014
1410260  ffff fb05 0004 feb0 2000 0004 0000 0000 0004 febf 2000 0004 0000 0000 0004 fed0 2000 0004 0000 0000 0004 fee0 2000 0004
1410340  0000 0000 0000 0000 a200 0000 0000 0000 0004 fef1 8200 0000 0000 e088 0004 fefc 8400 0000 0001 4130 0004 ff07 2600 0001
1410420  0003 ea60 0004 ff2a 8000 000c ffff fb05 0004 ff83 8000 000c ffff fb05 0004 ff97 8000 0010 ffff fb05 0005 0014 8000 0010
1410500  ffff fb05 0005 0028 8000 0018 ffff fb05 0005 00f7 8000 0018 ffff fb05 0005 0109 8000 0018 ffff fb05 0005 01ba 8000 0018
1410560  ffff fb05 0005 01cd 8000 0020 ffff fb05 0005 0295 8000 0020 ffff fb05 0005 02a6 8000 0014 ffff fb05 0005 0338 8000 0014
1410640  ffff fb05 0005 0349 8000 0020 ffff fb05 0005 03f1 8000 0020 ffff fb05 0005 0427 8000 0020 ffff fb05 0005 0439 8000 0008
1410720  ffff fb05 0005 0473 8000 0008 ffff fb05 0005 0488 8000 0010 ffff fb05 0005 0509 8000 0010 ffff fb05 0000 0000 a200 0000
1411000  0000 0000 0005 051d 2000 0010 0000 0000 0005 0538 2800 0001 0004 a250 0005 0548 2000 0014 0000 0000 0005 0557 2800 0004
1411060  0004 a254 0005 0568 8000 01fc ffff fb05 0005 05d4 8000 01fc ffff fb05 0005 05e5 2800 01fc 0004 a258 0005 05f4 2800 01fc
1411140  0004 a25c 0005 0603 8000 0008 ffff fb05 0005 0637 8000 0008 ffff fb05 0005 0648 2400 0001 0001 4130 0005 065b a000 0004
1411220  0000 0044 0005 0666 8400 0000 0001 4130 0000 0000 4400 0073 0001 4130 0000 0000 4400 0073 0001 4140 0005 066f 8000 0001
1411300  ffff fffc 0000 0000 c000 0002 0000 0010 0000 0000 4400 0076 0001 4140 0000 0000 4400 0077 0001 4150 0000 0000 4400 0078
1411360  0001 4160 0000 0000 4400 0079 0001 4168 0000 0000 e000 0002 0000 0044 0000 0000 4400 007a 0001 4174 0005 0679 2400 0010
1411440  0001 4184 0005 068a a000 0001 0000 0044 0005 069b a000 0001 0000 0048 0000 0000 4400 007e 0001 4184 0000 0000 4400 007e
1411520  0001 4198 0005 06ab 8000 0010 ffff fffc 0005 06b9 8000 0018 ffff fff8 0005 06c6 8000 0004 ffff fff4 0000 0000 c000 0002
1411600  0000 0068 0000 0000 4400 0083 0001 4198 0000 0000 4400 0085 0001 41a8 0000 0000 4400 0086 0001 41bc 0000 0000 4400 0088
1411660  0001 41c8 0000 0000 4400 0089 0001 41e4 0000 0000 4400 008b 0001 41f0 0000 0000 4400 008c 0001 4218 0000 0000 4400 008e
1411740  0001 422c 0000 0000 4400 008f 0001 4254 0000 0000 4400 0092 0001 4268 0000 0000 4400 0093 0001 4284 0000 0000 4400 0095
1412020  0001 4294 0000 0000 4400 0096 0001 429c 0000 0000 4400 0097 0001 42a4 0000 0000 4400 0098 0001 42ac 0000 0000 4400 0099
1412100  0001 42b4 0000 0000 4400 009b 0001 42bc 0000 0000 e000 0002 0000 0198 0000 0000 4400 009c 0001 42c8 0005 06d6 2400 0004
1412160  0001 42d8 0005 06e6 a000 0001 0000 0044 0005 06f7 a000 0001 0000 0048 0005 0707 a000 0001 0000 004c 0005 0716 a000 0001
1412240  0000 0050 0005 0726 a000 0001 0000 0054 0000 0000 4400 00a0 0001 42d8 0000 0000 4400 00a0 0001 42f8 0005 0736 8000 0018
1412320  ffff fffc 0005 0743 8000 0018 ffff fff8 0000 0000 c000 0002 0000 01c8 0000 0000 4400 00a4 0001 42f8 0000 0000 4400 00a5
```

```
1412400  0001 430c 0000 0000 4400 00a7 0001 4314 0000 0000 4400 00a8 0001 4324 0000 0000 4400 00ab 0001 4338 0000 0000 4400 00ac
1412460  0001 4358 0000 0000 4400 00ad 0001 4364 0000 0000 4400 00b1 0001 4378 0000 0000 4400 00b3 0001 4384 0000 0000 4400 00b4
1412540  0001 43a4 0000 0000 4400 00b8 0001 43b4 0000 0000 4400 00b9 0001 43e4 0000 0000 4400 00bc 0001 43fc 0000 0000 4400 00bd
1412620  0001 442c 0000 0000 4400 00c0 0001 4444 0000 0000 4400 00c1 0001 4474 0000 0000 4400 00c4 0001 448c 0000 0000 4400 00c5
1412700  0001 44bc 0000 0000 4400 00c7 0001 44d4 0000 0000 e000 0002 0000 03b4 0000 0000 4400 00c8 0001 44e4 0005 074e 2400 0014
1412760  0001 44f4 0005 075c a000 0001 0000 0044 0005 0768 a000 0001 0000 0048 0000 0000 4400 00cc 0001 44f4 0000 0000 4400 00cc
1413040  0001 4508 0005 0774 8000 0014 ffff fffc 0000 0000 c000 0002 0000 03d8 0000 0000 4400 00cf 0001 4508 0000 0000 4400 00d0
1413120  0001 4520 0000 0000 e000 0002 0000 03fc 0000 0000 4400 00d1 0001 452c 0005 0783 2400 0014 0001 453c 0005 0792 a000 0001
1413200  0000 0044 0005 079e a000 0001 0000 0048 0000 0000 4400 00d5 0001 453c 0000 0000 4400 00d5 0001 4550 0005 07aa 8000 0014
1413260  ffff fffc 0000 0000 c000 0002 0000 0420 0000 0000 4400 00d8 0001 4550 0000 0000 4400 00d9 0001 4568 0000 0000 4400 00da
1413340  0001 4578 0000 0000 e000 0002 0000 0454 0000 0000 4400 00db 0001 4584 0005 07b9 2400 0014 0001 4594 0005 07c9 a000 0001
1413420  0000 0044 0005 07d5 a000 0001 0000 0048 0005 07e1 a000 0004 0000 004c 0000 0000 4400 00e0 0001 4594 0000 0000 4400 00e0
1413500  0001 45ac 0005 07ef 8000 0018 ffff fffc 0005 07fc 8000 0020 ffff fff8 0005 0809 8000 0010 ffff fff4 0005 081c 8000 0014
1413560  ffff fff0 0005 082b 8000 000c ffff ffec 0005 0834 8000 0001 ffff ffe8 0000 0000 c000 0002 0000 047c 0000 0000 4400 00e8
1413640  0001 45ac 0000 0000 4400 00ea 0001 45c0 0000 0000 4400 00eb 0001 45d4 0000 0000 4400 00ed 0001 45f4 0000 0000 4400 00ee
1413720  0001 4608 0000 0000 4400 00f1 0001 4614 0000 0000 4400 00f2 0001 4630 0000 0000 4400 00f3 0001 4644 0000 0000 4400 00f5
1414000  0001 465c 0000 0000 4400 00f6 0001 4674 0000 0000 4400 00f7 0001 4690 0000 0000 4400 00f8 0001 46a0 0000 0000 4400 00fa
1414060  0001 46c0 0000 0000 4400 00fc 0001 46d8 0000 0000 4400 00fe 0001 46e8 0000 0000 4400 00ff 0001 4704 0000 0000 4400 0102
1414140  0001 4710 0000 0000 4400 0104 0001 4728 0000 0000 4400 0105 0001 476c 0000 0000 4400 0107 0001 4784 0000 0000 4400 0109
1414220  0001 4798 0000 0000 4400 010a 0001 47a8 0000 0000 4400 010c 0001 47b4 0000 0000 4400 010d 0001 47c4 0000 0000 4400 0110
1414300  0001 47d8 0000 0000 4400 0111 0001 47f8 0000 0000 4400 0115 0001 480c 0000 0000 4400 0117 0001 4818 0000 0000 4400 0118
1414360  0001 4838 0000 0000 4400 011b 0001 4848 0000 0000 4400 011c 0001 4858 0000 0000 4400 011d 0001 4864 0000 0000 4400 011e
1414440  0001 4870 0000 0000 4400 0120 0001 4884 0000 0000 4400 0121 0001 48b4 0000 0000 4400 0123 0001 48cc 0000 0000 4400 0124
1414520  0001 48f0 0000 0000 4400 0125 0001 4900 0000 0000 4400 0128 0001 4914 0000 0000 4400 0129 0001 4944 0000 0000 4400 012c
1414600  0001 4964 0000 0000 4400 012e 0001 4978 0000 0000 4400 012f 0001 4990 0000 0000 4400 0133 0001 49ac 0000 0000 4400 0134
1414660  0001 49d0 0000 0000 4400 013b 0001 49f4 0000 0000 4400 013d 0001 4a10 0000 0000 4400 013e 0001 4a3c 0000 0000 4400 013f
1414740  0001 4a50 0000 0000 4400 0140 0001 4a5c 0000 0000 4400 0141 0001 4a70 0000 0000 4400 0143 0001 4a80 0000 0000 e000 0002
1415020  0000 095c 0000 0000 4400 0144 0001 4a8c 0005 0841 2400 0004 0001 4a9c 0005 0851 a000 0010 0000 0044 0000 0000 4400 0149
1415100  0001 4a9c 0000 0000 4400 0149 0001 4aac 0005 085f 8000 0020 ffff fffc 0005 086c 8000 000c ffff fff8 0000 0000 c000 0002
1415160  0000 097c 0000 0000 4400 014d 0001 4aac 0000 0000 4400 014e 0001 4ad0 0000 0000 4400 0150 0001 4adc 0000 0000 4400 0152
1415240  0001 4af4 0000 0000 4400 0154 0001 4b0c 0000 0000 4400 0156 0001 4b2c 0000 0000 4400 0157 0001 4b48 0000 0000 4400 0154
1415320  0001 4b50 0000 0000 4400 0159 0001 4b64 0000 0000 4400 015a 0001 4b74 0000 0000 4400 015d 0001 4b80 0000 0000 4400 0160
1415400  0001 4ba4 0000 0000 4400 0162 0001 4be0 0000 0000 4400 0163 0001 4bf0 0000 0000 4400 0164 0001 4c00 0000 0000 4400 015d
1415460  0001 4c0c 0000 0000 4400 0168 0001 4c20 0000 0000 e000 0002 0000 0afc 0000 0000 4400 0169 0001 4c2c 0005 0875 2400 0004
1415540  0001 4c3c 0005 0887 a000 0010 0000 0044 0000 0000 4400 016e 0001 4c3c 0000 0000 4400 016e 0001 4c4c 0000 0000 4400 016f
1415620  0001 4c4c 0000 0000 4400 0170 0001 4c5c 0000 0000 4400 0171 0001 4c6c 0005 0896 2400 0004 0001 4c7c 0005 08a6 a000 0010
1415700  0000 0044 0000 0000 4400 0175 0001 4c7c 0000 0000 4400 0175 0001 4c8c 0005 08b4 8000 0014 ffff fffc 0005 08c0 8000 0020
1415760  ffff fff8 0005 08cd 8000 0014 ffff fff4 0005 08e0 8000 0004 ffff fff0 0000 0000 c000 0002 0000 0b5c 0000 0000 4400 017b
1416040  0001 4c8c 0000 0000 4400 017c 0001 4cb0 0000 0000 4400 017e 0001 4cb8 0000 0000 4400 0180 0001 4cd0 0000 0000 4400 0182
1416120  0001 4ce8 0000 0000 4400 0183 0001 4cf4 0000 0000 4400 0184 0001 4d10 0000 0000 4400 0185 0001 4128 0000 0000 4400 0187
1416200  0001 4d30 0000 0000 4400 0189 0001 4d54 0000 0000 4400 018b 0001 4d70 0000 0000 4400 018d 0001 4d88 0000 0000 4400 018e
1416260  0001 4d98 0000 0000 4400 018f 0001 4da8 0000 0000 4400 0190 0001 4dc4 0000 0000 4400 0191 0001 4dcc 0000 0000 4400 0189
1416340  0001 4dd4 0000 0000 4400 0187 0001 4de8 0000 0000 4400 0196 0001 4dfc 0000 0000 e000 0002 0000 0cd4 0000 0000 4400 0197
1416420  0001 4e04 0005 08f0 2400 0004 0001 4e14 0005 0901 a000 0004 0000 0044 0000 0000 4400 019b 0001 4e14 0000 0000 4400 019b
1416500  0001 4e24 0005 0912 8000 0018 ffff fffc 0005 091f 8000 0014 ffff fff8 0005 092b 8000 0020 ffff fff4 0005 0938 8000 0014
1416560  ffff fff0 0005 0944 8000 0010 ffff ffec 0005 0950 8000 0001 ffff ffe0 0000 0000 c000 0002 0000 0cf4 0000 0000 4400 01a3
1416640  0001 4e24 0000 0000 4400 01a4 0001 4e38 0000 0000 4400 01a6 0001 4e40 0000 0000 4400 01a7 0001 4e50 0000 0000 4400 01a8
1416720  0001 4e6c 0000 0000 4400 01a9 0001 4e78 0000 0000 4400 01aa 0001 4e8c 0000 0000 4400 01af 0001 4e94 0000 0000 4400 01b2
1417000  0001 4ee8 0000 0000 4400 01b4 0001 4ef8 0000 0000 4400 01b7 0001 4f0c 0000 0000 4400 01b8 0001 4f2c 0000 0000 4400 01bc
1417060  0001 4f40 0000 0000 4400 01be 0001 4f4c 0000 0000 4400 01bf 0001 4f6c 0000 0000 4400 01c3 0001 4f7c 0000 0000 4400 01c4
1417140  0001 4fb0 0000 0000 4400 01c8 0001 4fcc 0000 0000 4400 01c9 0001 4fcc 0000 0000 4400 01cc 0001 5008 0000 0000 4400 01cd
1417220  0001 502c 0000 0000 4400 01ce 0001 5048 0000 0000 4400 01d1 0001 505c 0000 0000 4400 01d2 0001 5090 0000 0000 4400 01d5
1417300  0001 50b4 0000 0000 4400 01d7 0001 50c8 0000 0000 4400 01d8 0001 50d4 0000 0000 4400 01dd 0001 50e0 0000 0000 4400 01e0
1417360  0001 50f4 0000 0000 4400 01e1 0001 5114 0000 0000 4400 01e5 0001 5128 0000 0000 4400 01e7 0001 5134 0000 0000 4400 01e8
1417440  0001 5154 0000 0000 4400 01ec 0001 5164 0000 0000 4400 01ed 0001 5198 0000 0000 4400 01ef 0001 51b4 0000 0000 4400 01f0
```

```
1417520 0001 5148 0000 0000 4400 01f1 0001 51e8 0000 0000 4400 01f2 0001 51f4 0000 0000 4400 01f3 0001 5200 0000 0000 4400 01f5
1417600 0001 5210 0000 0000 4400 01f7 0001 5224 0000 0000 4400 01f8 0001 5240 0000 0000 4400 01fb 0001 526c 0000 0000 e000 0002
1417660 0000 1160 0000 0000 4400 01fc 0001 5290 0005 0959 2400 0001 0001 52a0 0005 096c a000 0010 0000 0044 0000 0000 4400 0200
1417740 0001 52a0 0000 0000 4400 0200 0001 52b0 0005 097b 8000 0018 ffff fffc 0005 0988 8000 0004 ffff fff8 0000 0000 4400 0202
1420020 0001 52b0 0005 0993 8000 0001 ffff fff4 0005 099e 8000 0001 ffff fff0 0005 09a7 8000 0001 ffff ffec 0000 0000 c000 0002
1420100 0000 1188 0000 0000 4400 0206 0001 52b8 0000 0000 4400 0207 0001 52c0 0000 0000 4400 020b 0001 52d4 0000 0000 4400 020c
1420160 0001 52e0 0000 0000 4400 0211 0001 52ec 0000 0000 4400 0212 0001 5300 0000 0000 4400 0213 0001 531c 0000 0000 4400 0214
1420240 0001 5328 0000 0000 4400 0215 0001 5334 0000 0000 4400 0219 0001 5344 0000 0000 4400 021a 0001 5360 0000 0000 4400 021b
1420320 0001 5384 0000 0000 4400 021a 0001 53ac 0000 0000 4400 021c 0001 53b4 0000 0000 4400 0220 0001 53c8 0000 0000 4400 0225
1420400 0001 53d4 0000 0000 4400 0226 0001 53f8 0000 0000 4400 0225 0001 5410 0000 0000 4400 0228 0001 542c 0000 0000 4400 0229
1420460 0001 5454 0000 0000 4400 022b 0001 5478 0000 0000 4400 022c 0001 5498 0000 0000 4400 0229 0001 54b0 0000 0000 4400 022e
1420540 0001 54cc 0000 0000 4400 022f 0001 54d4 0000 0000 4400 0231 0001 54e4 0000 0000 e000 0002 0000 13c4 0000 0000 4400 0232
1420620 0001 54f4 0005 09b0 2400 0004 0001 5504 0005 09c1 a000 0018 0000 0044 0000 0000 4400 0238 0001 5504 0000 0000 4400 0238
1420700 0001 5514 0005 09cf 8000 0018 ffff fffc 0005 09da 8000 0020 ffff fff8 0005 09e7 8000 0014 ffff fff4 0000 0000 c000 0002
1420760 0000 13e4 0000 0000 4400 023d 0001 5514 0000 0000 4400 023e 0001 5520 0000 0000 4400 023f 0001 5530 0000 0000 4400 0240
1421040 0001 5540 0000 0000 4400 0242 0001 5550 0000 0000 4400 0244 0001 556c 0000 0000 4400 0245 0001 559c 0000 0000 4400 0246
1421120 0001 55a8 0000 0000 4400 0247 0001 55c0 0000 0000 4400 0248 0001 55cc 0000 0000 4400 0249 0001 55e4 0000 0000 4400 0242
1421200 0001 55f0 0000 0000 4400 024b 0001 5604 0000 0000 4400 024c 0001 5620 0000 0000 4400 024b 0001 562c 0000 0000 4400 024d
1421260 0001 5640 0000 0000 4400 024e 0001 565c 0000 0000 4400 024d 0001 5668 0000 0000 4400 0250 0001 567c 0000 0000 e000 0002
1421340 0000 1558 0000 0000 4400 0251 0001 5688 0005 09f3 2400 0004 0001 5698 0005 0a02 a000 0018 0000 0044 0000 0000 4400 0257
1421420 0001 5698 0000 0000 4400 0257 0001 56a8 0000 0000 4400 0258 0001 56a8 0000 0000 4400 0259 0001 56b4 0000 0000 4400 025a
1421500 0001 56c4 0000 0000 4400 025b 0001 56d4 0000 0000 4400 025c 0001 56e4 0000 0000 4400 025d 0001 56f4 0000 0000 4400 025e
1421560 0001 5700 0005 0a0e 2400 0004 0001 5710 0005 0a1e a000 0020 0000 0044 0000 0000 4400 0264 0001 5710 0000 0000 4400 0264
1421640 0001 5720 0000 0000 4400 0265 0001 5720 0000 0000 4400 0266 0001 572c 0000 0000 4400 0267 0001 573c 0000 0000 4400 0268
1421720 0001 574c 0000 0000 4400 0269 0001 575c 0000 0000 4400 026a 0001 576c 0000 0000 4400 026b 0001 577c 0000 0000 4400 026c
1422000 0001 5788 0005 0a2c 2400 0004 0001 5798 0005 0a3b a000 0014 0000 0044 0000 0000 4400 0272 0001 5798 0000 0000 4400 0272
1422060 0001 57a8 0005 0a48 8000 0020 ffff fffc 0000 0000 c000 0002 0000 1678 0000 0000 4400 0275 0001 57a8 0000 0000 4400 0276
1422140 0001 57b4 0000 0000 4400 0277 0001 57c4 0000 0000 4400 0278 0001 57d4 0000 0000 4400 0279 0001 57e4 0000 0000 4400 027b
1422220 0001 5800 0000 0000 4400 027c 0001 5818 0000 0000 4400 027d 0001 5824 0000 0000 4400 027e 0001 583c 0000 0000 4400 0279
1422300 0001 5848 0000 0000 4400 0281 0001 585c 0000 0000 e000 0002 0000 1738 0000 0000 4400 0282 0001 5868 0005 0a55 2400 0004
1422360 0001 5878 0005 0a65 a000 0020 0000 0044 0000 0000 4400 0288 0001 5878 0000 0000 4400 0288 0001 5888 0000 0000 4400 0289
1422440 0001 5888 0000 0000 4400 028a 0001 5894 0000 0000 4400 028b 0001 58a4 0000 0000 4400 028c 0001 58b4 0000 0000 4400 028d
1422520 0001 58c4 0000 0000 4400 028e 0001 58d0 0005 0a73 2400 0004 0001 58e0 0005 0a82 a000 0001 0000 0044 0000 0000 4400 0294
1422600 0001 58e0 0000 0000 4400 0294 0001 58f0 0000 0000 4400 0295 0001 58f0 0000 0000 4400 0298 0001 5908 0000 0000 4400 0299
1422660 0001 5928 0000 0000 4400 029a 0001 593c 0000 0000 4400 029b 0001 5948 0000 0000 4400 029d 0001 5954 0000 0000 4400 029e
1422740 0001 597c 0005 0a93 2400 0004 0001 599c 0005 0aa2 a000 0001 0000 0044 0000 0000 4400 02a4 0001 598c 0005 0ab0 4000 0001
1423020 0000 0018 0000 0000 4400 02a4 0001 5998 0005 0abe 4000 0001 0000 001d 0005 0ac8 8000 0004 ffff fffc 0000 0000 c000 0002
1423100 0000 1868 0000 0000 4400 02a8 0001 5998 0000 0000 4400 02a9 0001 59ac 0000 0000 4400 02ab 0001 59cc 0000 0000 4400 02ac
1423160 0001 59ec 0000 0000 4400 02ad 0001 5a00 0000 0000 4400 02ae 0001 5a0c 0000 0000 4400 02b0 0001 5a18 0000 0000 4400 02b1
1423240 0001 5a48 0000 0000 4400 02b0 0001 5a58 0000 0000 4400 02b3 0001 5a60 0000 0000 4400 02b4 0001 5a68 0000 0000 e000 0002
1423320 0000 1950 0000 0000 4400 02b5 0001 5a80 0005 0ad3 2400 0008 0001 5a90 0005 0aeb a000 0004 0000 0044 0005 0af8 a000 0001
1423400 0000 0048 0000 0000 4400 02bf 0001 5a90 0000 0000 4400 02bf 0001 5aa4 0005 0b06 8000 0008 ffff fffc 0005 0b0f 4000 0001
1423460 0000 001d 0005 0b19 8000 0004 ffff fff8 0000 0000 c000 0002 0000 1974 0000 0000 4400 02c4 0001 5aa4 0000 0000 4400 02c5
1423540 0001 5ab8 0000 0000 4400 02c6 0001 5abc 0000 0000 4400 02c7 0001 5aed 0000 0000 4400 02c6 0001 5af4 0000 0000 4400 02c9
1423620 0001 5b00 0000 0000 4400 02ca 0001 5b1c 0000 0000 4400 02cb 0001 5b34 0000 0000 4400 02cc 0001 5b44 0000 0000 4400 02ce
1423700 0001 5b58 0000 0000 4400 02cf 0001 5b60 0000 0000 4400 02d2 0001 5b70 0000 0000 4400 02d4 0001 5b78 0000 0000 e000 0002
1423760 0000 1a54 0000 0000 4400 02d5 0001 5b84 0005 0b24 2400 0001 0001 5b94 0005 0b36 a000 0010 0000 0044 0005 0b45 a000 0014
1424040 0000 0048 0005 0b52 a000 0001 0000 004c 0000 0000 4400 02dd 0001 5b94 0000 0000 4400 02dd 0001 5bac 0005 0b62 8000 0020
1424120 ffff fffc 0005 0b6f 8000 0010 ffff fff8 0005 0b7f 8000 0008 ffff fff4 0000 0000 c000 0002 0000 1a7c 0000 0000 4400 02e3
1424200 0001 5bac 0000 0000 4400 02e5 0001 5bb8 0000 0000 4400 02e6 0001 5bd4 0000 0000 4400 02e7 0001 5be4 0000 0000 4400 02e9
1424260 0001 5bf0 0000 0000 4400 02ea 0001 5c08 0000 0000 4400 02eb 0001 5c18 0000 0000 4400 02ed 0001 5c24 0000 0000 4400 02ee
1424340 0001 5c3c 0000 0000 4400 02ef 0001 5c4c 0000 0000 4400 02f1 0001 5c58 0000 0000 4400 02f3 0001 5c74 0000 0000 4400 02f6
1424420 0001 5c8c 0000 0000 4400 02f7 0001 5ca4 0000 0000 4400 02f9 0001 5cb4 0000 0000 4400 02fa 0001 5cc8 0000 0000 4400 02fb
1424500 0001 5cd8 0000 0000 4400 02ff 0001 5cf0 0000 0000 4400 0300 0001 5cf8 0000 0000 4400 0302 0001 5d00 0000 0000 4400 0304
1424560 0001 5d0c 0000 0000 4400 0305 0001 5d18 0000 0000 e000 0002 0000 1bf4 0000 0000 4400 0306 0001 5d24 0005 0b8c 2400 0001
```

```
1424640 0001 5d34 0005 0b9d a000 0010 0000 0044 0005 0bac a000 0001 0000 0048 0000 0000 4400 030d 0001 5d34 0000 0000 4400 030d
1424720 0001 5d48 0005 0bbc 8000 0018 ffff fffc 0005 0bc7 8000 0008 ffff fff8 0000 0000 c000 0002 0000 1c18 0000 0000 4400 0311
1425000 0001 5d48 0000 0000 4400 0313 0001 5d58 0000 0000 4400 0314 0001 5d78 0000 0000 4400 0315 0001 5d8c 0000 0000 4400 0317
1425060 0001 5d9c 0000 0000 4400 0318 0001 5db4 0000 0000 4400 0319 0001 5dc4 0000 0000 4400 031b 0001 5dd0 0000 0000 4400 031c
1425140 0001 5de8 0000 0000 4400 031d 0001 5df8 0000 0000 4400 031f 0001 5e04 0000 0000 4400 0320 0001 5e1c 0000 0000 4400 0321
1425220 0001 5e2c 0000 0000 4400 0323 0001 5e38 0000 0000 4400 0324 0001 5e50 0000 0000 4400 0325 0001 5e60 0000 0000 4400 0327
1425300 0001 5e6c 0000 0000 4400 0329 0001 5e78 0000 0000 4400 032a 0001 5e84 0000 0000 e000 0002 0000 1d60 0000 0000 4400 032b
1425360 0001 5e90 0005 0bd4 2400 0001 0001 5ea0 0005 0be6 a000 0010 0000 0044 0005 0bf5 a000 0001 0000 0048 0000 0000 4400 0332
1425440 0001 5ea0 0000 0000 4400 0332 0001 5eb4 0005 0c05 8000 0020 ffff fffc 0005 0c12 8000 0010 ffff fff8 0005 0c22 8000 0008
1425520 ffff fff4 0000 0000 c000 0002 0000 1d84 0000 0000 4400 0338 0001 5eb4 0000 0000 4400 033a 0001 5ec4 0000 0000 4400 033b
1425600 0001 5ee4 0000 0000 4400 033c 0001 5ef8 0000 0000 4400 033e 0001 5f08 0000 0000 4400 033f 0001 5f20 0000 0000 4400 0340
1425660 0001 5f30 0000 0000 4400 0342 0001 5f3c 0000 0000 4400 0343 0001 5f54 0000 0000 4400 0344 0001 5f64 0000 0000 4400 0346
1425740 0001 5f70 0000 0000 4400 0347 0001 5f88 0000 0000 4400 0348 0001 5f98 0000 0000 4400 034a 0001 5fa4 0000 0000 4400 034b
1426020 0001 5fbc 0000 0000 4400 034c 0001 5fcc 0000 0000 4400 034e 0001 5fd8 0000 0000 4400 0350 0001 5ff4 0000 0000 4400 0353
1426100 0001 600c 0000 0000 4400 0354 0001 6024 0000 0000 4400 0356 0001 6034 0000 0000 4400 0357 0001 6048 0000 0000 4400 0358
1426160 0001 6058 0000 0000 4400 035c 0001 6070 0000 0000 4400 035d 0001 6078 0000 0000 4400 035f 0001 6080 0000 0000 4400 0360
1426240 0001 608c 0000 0000 e000 0002 0000 1f68 0000 0000 4400 0361 0001 6098 0005 0c2f 2400 0001 0001 60a8 0005 0c40 a000 0010
1426320 0000 0044 0005 0c4f a000 0001 0000 0048 0000 0000 4400 0368 0001 60a8 0000 0000 4400 0368 0001 60bc 0005 0c5f 8000 0014
1426400 ffff fffc 0005 0c6b 8000 0008 ffff fff8 0000 0000 c000 0002 0000 1f8c 0000 0000 4400 036c 0001 60bc 0000 0000 4400 036e
1426460 0001 60cc 0000 0000 4400 036f 0001 60ec 0000 0000 4400 0370 0001 6100 0000 0000 4400 0372 0001 6110 0000 0000 4400 0374
1426540 0001 6118 0000 0000 4400 0375 0001 6130 0000 0000 4400 0376 0001 6140 0000 0000 4400 0378 0001 614c 0000 0000 4400 0379
1426620 0001 6164 0000 0000 4400 037a 0001 6174 0000 0000 4400 037c 0001 6180 0000 0000 4400 037d 0001 6198 0000 0000 4400 037e
1426700 0001 61a8 0000 0000 4400 0380 0001 61b4 0000 0000 4400 0381 0001 61cc 0000 0000 4400 0383 0001 61f4 0000 0000 4400 0384
1426760 0001 6200 0000 0000 e000 0002 0000 20dc 0000 0000 4400 0385 0001 620c 0005 0c78 2400 0001 0001 621c 0005 0c8b a000 0010
1427040 0000 0044 0005 0c9a a000 0001 0000 0048 0000 0000 4400 038c 0001 621c 0000 0000 4400 038c 0001 6230 0005 0caa 8000 0018
1427120 ffff fffc 0005 0cb7 8000 0008 ffff fff8 0000 0000 c000 0002 0000 2100 0000 0000 4400 0390 0001 6230 0000 0000 4400 0391
1427200 0001 6248 0000 0000 4400 0393 0001 6254 0000 0000 4400 0396 0001 6260 0000 0000 4400 0397 0001 627c 0000 0000 4400 0399
1427260 0001 6288 0000 0000 4400 039a 0001 62a0 0000 0000 4400 039b 0001 62b0 0000 0000 4400 039d 0001 62bc 0000 0000 4400 039e
1427340 0001 62d4 0000 0000 4400 039f 0001 62e4 0000 0000 4400 03a1 0001 62f0 0000 0000 4400 03a2 0001 6308 0000 0000 4400 03a3
1427420 0001 6318 0000 0000 4400 03a5 0001 6324 0000 0000 4400 03a6 0001 6330 0000 0000 4400 03a7 0001 633c 0000 0000 4400 03ab
1427500 0001 6348 0000 0000 4400 03ac 0001 6360 0000 0000 4400 03af 0001 6368 0000 0000 4400 03b0 0001 637c 0000 0000 4400 03b3
1427560 0001 6384 0000 0000 4400 03b4 0001 6398 0000 0000 4400 03b7 0001 63a0 0000 0000 4400 03b8 0001 63b4 0000 0000 4400 03bb
1427640 0001 63bc 0000 0000 4400 03be 0001 63c4 0000 0000 4400 03ac 0001 63d0 0000 0000 4400 03c1 0001 6418 0000 0000 4400 03c2
1427720 0001 6424 0000 0000 e000 0002 0000 2300 0000 0000 4400 03c3 0001 6430 0005 0cc4 2400 0010 0001 6440 0005 0cd8 a000 0001
1430000 0000 0044 0000 0000 4400 03c9 0001 6440 0000 0000 4400 03c9 0001 6450 0005 0ce8 8000 0010 ffff fffc 0005 0cf6 8000 0004
1430060 ffff fff8 0000 0000 c000 0002 0000 2320 0000 0000 4400 03cd 0001 6450 0000 0000 4400 03ce 0001 6478 0000 0000 4400 03d0
1430140 0001 6484 0000 0000 4400 03d2 0001 6494 0000 0000 4400 03d3 0001 64a8 0000 0000 4400 03d4 0001 64b4 0000 0000 4400 03d5
1430220 0001 64bc 0000 0000 4400 03d6 0001 64c4 0000 0000 4400 03d8 0001 64d8 0000 0000 e000 0002 0000 23b4 0000 0000 4400 03d9
1430300 0001 64e4 0005 0d06 2400 0010 0001 64f4 0005 0d18 a000 0014 0000 0044 0000 0000 4400 03e3 0001 64f4 0000 0000 4400 03e3
1430360 0001 6504 0005 0d22 8000 0010 ffff fffc 0005 0d30 8000 0004 ffff fff8 0005 0d40 8000 0001 ffff fff4 0005 0d4b 8000 0004
1430440 ffff fff0 0005 0d53 8000 0004 ffff ffec 0000 0000 c000 0002 0000 23d4 0000 0000 4400 03e9 0001 6504 0000 0000 4400 03ea
1430520 0001 6518 0000 0000 4400 03ee 0001 6524 0000 0000 4400 03f3 0001 6530 0000 0000 4400 03f4 0001 6540 0000 0000 4400 03f5
1430600 0001 6558 0000 0000 4400 03f6 0001 6564 0000 0000 4400 03f7 0001 6570 0000 0000 4400 03fb 0001 6580 0000 0000 4400 03fd
1430660 0001 65f0 0000 0000 4400 03fe 0001 6600 0000 0000 4400 0400 0001 6608 0000 0000 4400 0403 0001 6624 0000 0000 4400 0404
1430740 0001 6640 0000 0000 4400 0405 0001 6654 0000 0000 4400 0406 0001 6660 0000 0000 4400 0408 0001 666c 0000 0000 4400 040a
1431020 0001 669c 0000 0000 4400 040c 0001 66ac 0000 0000 4400 0404 0001 66b8 0000 0000 4400 0413 0001 66c4 0000 0000 4400 0414
1431100 0001 66ec 0000 0000 4400 0413 0001 6704 0000 0000 4400 0416 0001 6720 0000 0000 4400 0418 0001 6744 0000 0000 4400 041a
1431160 0001 6768 0000 0000 4400 041b 0001 6788 0000 0000 4400 0418 0001 67a0 0000 0000 4400 041d 0001 67bc 0000 0000 4400 041f
1431240 0001 67c4 0000 0000 4400 0420 0001 67e4 0000 0000 4400 0422 0001 67f0 0000 0000 4400 0424 0001 67fc 0000 0000 e000 0002
1431320 0000 26d8 0000 0000 4400 0425 0001 6808 0005 0d5e 2400 0004 0001 6818 0005 0d70 a000 0014 0000 0044 0000 0000 4400 042e
1431400 0001 6818 0000 0000 4400 042e 0001 6828 0005 0d7a 8000 0001 ffff fff0 0005 0d98 8000 0004 ffff ffec 0005 0da2 8000 0004
1431460 ffff ffe8 0005 0daa 8000 0004 ffff ffe4 0000 0000 c000 0002 0000 26f8 0000 0000 4400 0432 0001 6828 0000 0000 4400 0433
1431540 0001 6830 0000 0000 4400 0434 0001 6838 0000 0000 4400 0435 0001 6840 0000 0000 4400 0437 0001 68a0 0000 0000 4400 0438
1431620 0001 68b0 0000 0000 4400 043a 0001 68b8 0000 0000 4400 043c 0001 68c8 0000 0000 4400 043d 0001 68cc 0000 0000 4400 043f
1431700 0001 68d4 0000 0000 4400 0440 0001 68e4 0000 0000 4400 0442 0001 68ec 0000 0000 4400 0443 0001 6908 0000 0000 4400 0444
```

```
1431760  0001 6918 0000 0000 4400 0446 0001 6920 0000 0000 4400 0448 0001 6944 0000 0000 4400 0449 0001 694c 0000 0000 4400 044c
1432040  0001 695c 0000 0000 4400 044f 0001 696c 0000 0000 e000 0002 0000 2844 0000 0000 4400 0450 0001 6974 0005 0db7 2400 0010
1432120  0001 6984 0005 0dc9 a000 0004 0000 0044 0000 0000 4400 045a 0001 6984 0000 0000 4400 045a 0001 6994 0005 0dd4 8000 0010
1432200  ffff fffc 0005 0de2 8000 0004 ffff fff8 0005 0df2 8000 0001 ffff fff4 0005 0dfd 8000 0004 ffff fff0 0005 0e05 8000 0004
1432260  ffff ffec 0000 0000 c000 0002 0000 2864 0000 0000 4400 0463 0001 6994 0000 0000 4400 0468 0001 69ac 0000 0000 4400 0469
1432340  0001 69bc 0000 0000 4400 046a 0001 69d4 0000 0000 4400 046b 0001 69e0 0000 0000 4400 046c 0001 69ec 0000 0000 4400 0470
1432420  0001 69fc 0000 0000 4400 0472 0001 6a28 0000 0000 4400 0475 0001 6a44 0000 0000 4400 0476 0001 6a60 0000 0000 4400 0477
1432500  0001 6a74 0000 0000 4400 0478 0001 6a90 0000 0000 4400 047a 0001 6a8c 0000 0000 4400 047c 0001 6abc 0000 0000 4400 047e
1432560  0001 6acc 0000 0000 4400 047f 0001 6ad8 0000 0000 4400 0485 0001 6ae4 0000 0000 4400 0486 0001 6b0c 0000 0000 4400 0485
1432640  0001 6b24 0000 0000 4400 0487 0001 6b40 0000 0000 4400 0488 0001 6b64 0000 0000 4400 048a 0001 6b88 0000 0000 4400 048b
1432720  0001 6ba8 0000 0000 4400 0488 0001 6bc0 0000 0000 4400 048d 0001 6bdc 0000 0000 4400 0491 0001 6be4 0000 0000 4400 0493
1433000  0001 6c00 0000 0000 4400 0494 0001 6c0c 0000 0000 4400 0497 0001 6c18 0000 0000 4400 0498 0001 6c2c 0000 0000 4400 0499
1433060  0001 6c38 0000 0000 4400 049b 0001 6c44 0000 0000 e000 0002 0000 2b20 0000 0000 4400 049c 0001 6c50 0005 0e10 2400 0004
1433140  0001 6c60 0005 0e20 a000 0004 0000 0044 0005 0e2b a000 0001 0000 0048 0005 0e39 a000 0004 0000 004c 0000 0000 4400 04a6
1433220  0001 6c60 0000 0000 4400 04a6 0001 6c78 0005 0e44 8000 0001 ffff fffc 0005 0e4e 8000 0004 ffff fff8 0005 0e58 8000 0004
1433300  ffff fff4 0000 0000 c000 0002 0000 2b48 0000 0000 4400 04ab 0001 6c78 0000 0000 4400 04ac 0001 6c98 0000 0000 4400 04ad
1433360  0001 6c8c 0000 0000 4400 04af 0001 6ca8 0000 0000 4400 04b0 0001 6cc4 0000 0000 4400 04b1 0001 6ce4 0000 0000 4400 04b4
1433440  0001 6cf0 0000 0000 4400 04b6 0001 6d04 0000 0000 4400 04b7 0001 6d10 0000 0000 4400 04bb 0001 6d20 0000 0000 4400 04be
1433520  0001 6d2c 0000 0000 e000 0002 0000 2c04 0000 0000 4400 04bf 0001 6d34 0005 0e60 2400 0004 0001 6d44 0005 0e72 a000 0010
1433600  0000 0044 0000 0000 4400 04c6 0001 6d44 0000 0000 4400 04c6 0001 6d54 0005 0e81 8000 0018 ffff fffc 0005 0e8e 8000 0018
1433660  ffff fff8 0005 0e9a 8000 0020 ffff fff4 0005 0ea5 8000 0014 ffff fff0 0005 0eb0 8000 0008 ffff ffec 0005 0ec3 8000 0001
1433740  ffff ffe8 0000 0000 c000 0002 0000 2c24 0000 0000 4400 04ce 0001 6d54 0000 0000 4400 04cf 0001 6d78 0000 0000 4400 04d1
1434020  0001 6d80 0000 0000 4400 04d2 0001 6d90 0000 0000 4400 04d3 0001 6d9c 0000 0000 4400 04d5 0001 6db0 0000 0000 4400 04d6
1434100  0001 6dc4 0000 0000 4400 04d7 0001 6dd8 0000 0000 4400 04d8 0001 6dec 0000 0000 4400 04d9 0001 6e0c 0000 0000 4400 04db
1434160  0001 6e20 0000 0000 4400 04dc 0001 6e30 0000 0000 4400 04dd 0001 6e44 0000 0000 4400 04de 0001 6e58 0000 0000 4400 04e1
1434240  0001 6e6c 0000 0000 4400 04e3 0001 6e78 0000 0000 4400 04e4 0001 6e78 0000 0000 4400 04e6 0001 6e94 0000 0000 4400 04e8
1434320  0001 6ea4 0000 0000 4400 04ea 0001 6ec0 0000 0000 4400 04ec 0001 6ed8 0000 0000 4400 04ee 0001 6ed8 0000 0000 4400 04e8
1434400  0001 6f08 0000 0000 4400 04f1 0001 6f1c 0000 0000 4400 04f3 0001 6f2c 0000 0000 4400 04f5 0001 6f48 0000 0000 4400 04f7
1434460  0001 6f48 0000 0000 4400 04f3 0001 6f8c 0000 0000 4400 04f9 0001 6fa0 0000 0000 4400 04fb 0001 6fb0 0000 0000 4400 04fd
1434540  0001 6fcc 0000 0000 4400 04fe 0001 6fcc 0000 0000 4400 04fb 0001 6fec 0000 0000 4400 0500 0001 7000 0000 0000 4400 0502
1434620  0001 7010 0000 0000 e000 0002 0000 2ee8 0000 0000 4400 0503 0001 7018 0005 0ecd 2400 0001 0001 7028 0005 0edd a000 0001
1434700  0000 0044 0000 0000 4400 050c 0001 7028 0000 0000 4400 050c 0001 7038 0005 0ee9 2800 0001 0004 a260 0000 0000 4400 050d
1434760  0001 7038 0000 0000 c000 0002 0000 2f08 0000 0000 4400 050f 0001 7038 0000 0000 4400 0511 0001 7050 0000 0000 4400 0512
1435040  0001 7068 0000 0000 4400 0515 0001 7078 0000 0000 4400 0516 0001 7088 0000 0000 4400 0517 0001 7098 0000 0000 4400 0518
1435120  0001 70a4 0000 0000 4400 0519 0001 70b4 0000 0000 4400 051a 0001 70c4 0000 0000 4400 051b 0001 70d0 0000 0000 4400 051c
1435200  0001 70e0 0000 0000 4400 051d 0001 70f0 0000 0000 4400 051e 0001 70fc 0000 0000 4400 051f 0001 710c 0000 0000 4400 0520
1435260  0001 711c 0000 0000 4400 0521 0001 7128 0000 0000 4400 0522 0001 7138 0000 0000 4400 0523 0001 7148 0000 0000 4400 0524
1435340  0001 7154 0000 0000 4400 0525 0001 7164 0000 0000 4400 0526 0001 7174 0000 0000 4400 0528 0001 717c 0000 0000 e000 0002
1435420  0000 305c 0000 0000 4400 0529 0001 718c 0005 0f0c 2400 0004 0001 719c 0005 0f1b a000 0004 0000 0044 0005 0f25 a000 0001
1435500  0000 0048 0005 0f32 a000 0001 0000 004c 0000 0000 4400 053c 0001 719c 0000 0000 4400 053c 0001 71b4 0005 0f3e 8000 0004
1435560  ffff fffc 0005 0f48 8000 0004 ffff fff8 0005 0f52 8000 0010 ffff fff4 0005 0f5f 8000 0001 ffff fef0 0000 0000 c000 0002
1435640  0000 3084 0000 0000 4400 0541 0001 71b4 0000 0000 4400 0542 0001 71d8 0000 0000 4400 0544 0001 71ec 0000 0000 4400 0546
1435720  0001 71f8 0000 0000 4400 0548 0001 7224 0000 0000 4400 0549 0001 7238 0000 0000 4400 054a 0001 7248 0000 0000 4400 054c
1436000  0001 7270 0000 0000 4400 054e 0001 728c 0000 0000 4400 054f 0001 7299 0000 0000 4400 0551 0001 72a4 0000 0000 4400 0555
1436060  0001 72b0 0000 0000 e000 0002 0000 318c 0000 0000 4400 0556 0001 72bc 0005 0f80 2400 0004 0001 72cc 0005 0f8f a000 0004
1436140  0000 0044 0000 0000 4400 055d 0001 72cc 0000 0000 4400 055d 0001 72dc 0005 0f9a 8000 0014 ffff fffc 0005 0fa6 8000 0020
1436220  ffff fff8 0005 0fb3 8000 0004 ffff fff4 0005 0fbd 8000 0014 ffff fff0 0005 0fc9 8000 0004 ffff ffec 0005 0fd2 8000 0001
1436300  ffff ffe8 0005 0fe1 8000 0001 ffff fee4 0000 0000 c000 0002 0000 31ac 0000 0000 4400 0565 0001 72dc 0000 0000 4400 0567
1436360  0001 72f0 0000 0000 4400 0568 0001 730c 0000 0000 4400 056a 0001 7324 0000 0000 4400 056b 0001 7338 0000 0000 4400 056c
1436440  0001 734c 0000 0000 4400 056e 0001 7378 0000 0000 4400 056f 0001 7384 0000 0000 4400 0570 0001 7398 0000 0000 4400 0571
1436520  0001 73b0 0000 0000 4400 0573 0001 73d8 0000 0000 4400 0574 0001 73e8 0000 0000 4400 0577 0001 73f4 0000 0000 4400 057a
1436600  0001 740c 0000 0000 4400 057e 0001 7430 0000 0000 4400 0581 0001 744c 0000 0000 4400 0582 0001 7464 0000 0000 4400 057e
1436660  0001 746c 0000 0000 4400 0584 0001 7480 0000 0000 4400 0585 0001 74a8 0000 0000 4400 057a 0001 74b0 0000 0000 4400 0587
1436740  0001 74c4 0000 0000 4400 0588 0001 74ec 0000 0000 4400 058b 0001 74f4 0000 0000 4400 058d 0001 7504 0000 0000 e000 0002
1437020  0000 33e0 0000 0000 4400 058e 0001 7510 0005 0fee 2400 0008 0001 7520 0005 0fff a000 0001 0000 0044 0000 0000 4400 0597
```

```
1437100 0001 7520 0000 0000 4400 0597 0001 7530 0005 1009 8000 0008 ffff fffc 0005 1012 8000 0004 ffff fff8 0000 0000 c000 0002
1437160 0000 3400 0000 0000 4400 059b 0001 7530 0000 0000 4400 059c 0001 7540 0000 0000 4400 059e 0001 7544 0000 0000 4400 059f
1437240 0001 755c 0000 0000 4400 05a2 0001 756c 0000 0000 4400 05a4 0001 7584 0000 0000 4400 05a6 0001 75a4 0000 0000 4400 05a7
1437320 0001 75ac 0000 0000 4400 05ab 0001 75bc 0000 0000 4400 05ad 0001 75d0 0000 0000 4400 05af 0001 75e0 0000 0000 4400 05b1
1437400 0001 75fc 0000 0000 4400 05b2 0001 7620 0000 0000 4400 05b6 0001 7638 0000 0000 4400 05b8 0001 7644 0000 0000 e000 0002
1437460 0000 3520 0000 0000 4400 05b9 0001 7650 0005 1021 2400 0004 0001 7660 0005 1032 a000 0010 0000 0044 0000 0000 4400 05c9
1437540 0001 7660 0000 0000 4400 05c9 0001 7670 0005 1041 8000 0004 ffff fffc 0005 1052 8000 0010 ffff fff8 0005 105f 8000 0010
1437620 ffff fff4 0005 1069 8000 0010 ffff fff0 0005 107b 8000 0010 ffff ffec 0000 0000 c000 0002 0000 3540 0000 0000 4400 05d0
1437700 0001 7670 0000 0000 4400 05d1 0001 7680 0000 0000 4400 05d2 0001 7694 0000 0000 4400 05d3 0001 76a4 0000 0000 4400 05d4
1437760 0001 76ac 0000 0000 4400 05d5 0001 76b4 0000 0000 4400 05d6 0001 76c0 0000 0000 4400 05d7 0001 76c8 0000 0000 4400 05d8
1440040 0001 76d8 0000 0000 4400 05d9 0001 76f0 0000 0000 4400 05d8 0001 76f8 0000 0000 4400 05e0 0001 770c 0000 0000 4400 05e1
1440120 0001 7714 0000 0000 4400 05e3 0001 7724 0000 0000 4400 05e5 0001 7738 0000 0000 4400 05e6 0001 7744 0000 0000 4400 05e9
1440200 0001 774c 0000 0000 4400 05ea 0001 7754 0000 0000 4400 05ec 0001 776c 0000 0000 4400 05ed 0001 7794 0000 0000 4400 05ef
1440260 0001 779c 0000 0000 4400 05f1 0001 77c0 0000 0000 4400 05f2 0001 77dc 0000 0000 4400 05f5 0001 77f0 0000 0000 4400 05f6
1440340 0001 77fc 0000 0000 4400 05ea 0001 7804 0000 0000 4400 05fb 0001 7818 0000 0000 4400 05fe 0001 782c 0000 0000 4400 0600
1440420 0001 7844 0000 0000 4400 0601 0001 7858 0000 0000 4400 05fe 0001 7864 0000 0000 4400 0604 0001 7878 0000 0000 e000 0002
1440500 0000 3754 0000 0000 4400 0605 0001 7884 0005 1086 2400 0010 0001 7894 0005 1099 a000 0010 0000 0044 0005 10a7 a000 0002
1440560 0000 0048 0005 10b4 a000 0004 0000 004c 0000 0000 4400 060d 0001 7894 0000 0000 4400 060d 0001 78ac 0005 10c6 8000 0010
1440640 ffff fffc 0005 1016 8000 0010 ffff fff8 0005 10e0 8000 0010 ffff fff4 0005 10f4 8000 0020 ffff fff0 0005 1101 8000 0014
1440720 ffff ffec 0005 110d 8000 0020 ffff ffe8 0000 0000 c000 0002 0000 377c 0000 0000 4400 0614 0001 78ac 0000 0000 4400 0615
1441000 0001 78c4 0000 0000 4400 0617 0001 78cc 0000 0000 4400 061a 0001 78e4 0000 0000 4400 061d 0001 7904 0000 0000 4400 0621
1441060 0001 7918 0000 0000 4400 0622 0001 7930 0000 0000 4400 0623 0001 793c 0000 0000 4400 0624 0001 794c 0000 0000 4400 0625
1441140 0001 795c 0000 0000 4400 0626 0001 7968 0000 0000 4400 0627 0001 7974 0000 0000 4400 061a 0001 797c 0000 0000 4400 062c
1441220 0001 7990 0000 0000 4400 0630 0001 79b0 0000 0000 4400 0633 0001 79cc 0000 0000 4400 0637 0001 79e0 0000 0000 4400 0638
1441300 0001 79f8 0000 0000 4400 0639 0001 7a04 0000 0000 4400 063a 0001 7a14 0000 0000 4400 063b 0001 7a24 0000 0000 4400 063c
1441360 0001 7a30 0000 0000 4400 0634 0001 7a3c 0000 0000 4400 0630 0001 7a44 0000 0000 4400 062c 0001 7a58 0000 0000 4400 0617
1441440 0001 7a6c 0000 0000 4400 0643 0001 7a80 0000 0000 e000 0002 0000 3960 0000 0000 4400 0644 0001 7a90 0005 111a 2400 0004
1441520 0001 7aa0 0005 112b a000 0010 0000 0044 0005 1139 a000 0004 0000 0048 0000 0000 4400 064d 0001 7aa0 0000 0000 4400 064d
1441600 0001 7ab4 0005 114b 8000 0010 ffff fffc 0005 115d 8000 0010 ffff fff8 0005 116e 8000 0010 ffff fff4 0005 117c 8000 0002
1441660 ffff fff2 0000 0000 c000 0002 0000 3984 0000 0000 4400 0651 0001 7ab4 0000 0000 4400 0652 0001 7abc 0000 0000 4400 0653
1441740 0001 7ac4 0000 0000 4400 0655 0001 7acc 0000 0000 4400 0658 0001 7adc 0000 0000 4400 065a 0001 7b00 0000 0000 4400 065b
1442020 0001 7b0c 0000 0000 4400 065d 0001 7b20 0000 0000 4400 0660 0001 7b34 0000 0000 4400 0661 0001 7b3c 0000 0000 4400 0664
1442100 0001 7b58 0000 0000 e000 0002 0000 3a30 0000 0000 4400 0665 0001 7b60 0005 1188 2400 0004 0001 7b70 0005 1199 a000 0018
1442160 0000 0044 0005 11a5 a000 0018 0000 0048 0000 0000 4400 066d 0001 7b70 0000 0000 4400 066d 0001 7b84 0000 0000 4400 066e
1442240 0001 7b84 0000 0000 4400 066f 0001 7ba8 0000 0000 4400 0671 0001 7bb4 0000 0000 4400 0672 0001 7bd8 0000 0000 4400 0674
1442320 0001 7be4 0000 0000 4400 0675 0001 7bf0 0005 11b1 2400 0001 0001 7c00 0005 11c2 a000 0014 0000 0044 0000 0000 4400 067c
1442400 0001 7c00 0000 0000 4400 067c 0001 7c10 0005 11cc 8000 0004 ffff fffc 0005 11d4 8000 0004 ffff fff8 0005 11dd 8000 0004
1442460 ffff fff4 0005 11e6 8000 0004 ffff fff0 0005 11ef 8000 0004 ffff ffec 0005 11f9 8000 0001 ffff ffe0 0000 0000 c000 0002
1442540 0000 3ae0 0000 0000 4400 0680 0001 7c10 0000 0000 4400 0681 0001 7c20 0000 0000 4400 0683 0001 7c20 0000 0000 4400 0684
1442620 0001 7c80 0000 0000 4400 0685 0001 7c88 0000 0000 4400 0686 0001 7c98 0000 0000 4400 0687 0001 7cf8 0000 0000 4400 0688
1442700 0001 7d00 0000 0000 4400 0689 0001 7d10 0000 0000 4400 068a 0001 7d70 0000 0000 4400 068b 0001 7d78 0000 0000 4400 068d
1442760 0001 7d90 0000 0000 4400 068e 0001 7db0 0000 0000 4400 068f 0001 7dc8 0000 0000 4400 0691 0001 7dcc 0000 0000 e000 0002
1443040 0000 3ca8 0000 0000 4400 0692 0001 7dd8 0005 1219 2400 0004 0001 7de8 0005 1229 a000 0001 0000 0044 0005 1232 a000 0001
1443120 0000 0048 0000 0000 4400 0696 0001 7de8 0000 0000 4400 0696 0001 7dfc 0000 0000 4400 0697 0001 7dfc 0000 0000 4400 0698
1443200 0001 7e14 0000 0000 4400 0699 0001 7e30 0000 0000 4400 069a 0001 7e78 0000 0000 4400 069b 0001 7e80 0000 0000 4400 069c
1443260 0001 7ec8 0000 0000 4400 069e 0001 7ed0 0000 0000 4400 069f 0001 7edc 0000 0000 4400 06a1 0001 7ef0 0000 0000 4400 06a2
1443340 0001 7f10 0005 123b 2400 0020 0001 7f20 0005 124b a000 0018 0000 0044 0005 1258 a000 0001 0000 0048 0005 1264 a000 0001
1443420 0000 004c 0000 0000 4400 06ad 0001 7f20 0000 0000 4400 06ad 0001 7f38 0005 1272 8000 0020 ffff fffc 0005 1283 8000 0014
1443500 ffff fff8 0000 0000 c000 0002 0000 3e08 0000 0000 4400 06b1 0001 7f38 0000 0000 4400 06b2 0001 7f48 0000 0000 4400 06b4
1443560 0001 7f54 0000 0000 4400 06b5 0001 7f68 0000 0000 4400 06b6 0001 7f7c 0000 0000 4400 06b7 0001 7f8c 0000 0000 4400 06b8
1443640 0001 7f9c 0000 0000 4400 06bb 0001 7fa8 0000 0000 4400 06be 0001 7fc4 0000 0000 4400 06bf 0001 7fd8 0000 0000 4400 06c0
1443720 0001 7ff8 0000 0000 4400 06c1 0001 8034 0000 0000 4400 06c2 0001 8018 0000 0000 4400 06c3 0001 8038 0000 0000 4400 06c4
1444000 0001 8044 0000 0000 4400 06c5 0001 8058 0000 0000 4400 06c6 0001 8078 0000 0000 4400 06bb 0001 8084 0000 0000 4400 06c9
1444060 0001 8098 0000 0000 e000 0002 0000 3f74 0000 0000 4400 06ca 0001 80a4 0005 128c 2400 0014 0001 80b4 0005 129b a000 0018
1444140 0000 0044 0005 12a8 a000 0001 0000 0048 0005 12b4 a000 0001 0000 004c 0000 0000 4400 06d4 0001 80b4 0000 0000 4400 06d4
```

```
1444220 0001 80cc 0005 12c2 8000 0014 ffff fffc 0005 12d2 8000 0014 ffff fff8 0000 0000 c000 0002 0000 3f9c 0000 0000 4400 06d8
1444300 0001 80cc 0000 0000 4400 06d9 0001 80dc 0000 0000 4400 06db 0001 80e8 0000 0000 4400 06dc 0001 80fc 0000 0000 4400 06dd
1444360 0001 8110 0000 0000 4400 06de 0001 8120 0000 0000 4400 06df 0001 8130 0000 0000 4400 06e2 0001 813c 0000 0000 4400 06e5
1444440 0001 8158 0000 0000 4400 06e6 0001 816c 0000 0000 4400 06e7 0001 818c 0000 0000 4400 06e8 0001 8198 0000 0000 4400 06e9
1444520 0001 81ac 0000 0000 4400 06ea 0001 81cc 0000 0000 4400 06eb 0001 81d8 0000 0000 4400 06ec 0001 81ec 0000 0000 4400 06ed
1444600 0001 820c 0000 0000 4400 06e2 0001 8218 0000 0000 4400 06f0 0001 822c 0000 0000 e000 0002 0000 4108 0000 0000 4400 06f1
1444660 0001 8238 0005 12db 2400 0020 0001 8248 0005 12eb a000 0014 0000 0044 0005 12fc a000 0001 0000 0048 0000 0000 4400 06f9
1444740 0001 8248 0000 0000 4400 06f9 0001 825c 0005 1308 8000 0020 ffff fffc 0000 0000 c000 0002 0000 412c 0000 0000 4400 06fc
1445020 0001 825c 0000 0000 4400 06fd 0001 826c 0000 0000 4400 0700 0001 8278 0000 0000 4400 0703 0001 8294 0000 0000 4400 0704
1445100 0001 82b4 0000 0000 4400 0700 0001 82c0 0000 0000 4400 0707 0001 82d4 0000 0000 e000 0002 0000 41b0 0000 0000 4400 0708
1445160 0001 82e0 0005 1319 2400 0001 0001 82f0 0005 1329 a000 0020 0000 0044 0000 0000 4400 070e 0001 82f0 0000 0000 4400 070e
1445240 0001 8300 0000 0000 4400 070f 0001 8300 0000 0000 4400 0710 0001 8310 0000 0000 4400 0712 0001 8320 0000 0000 4400 0713
1445320 0001 832c 0005 133b 2400 0001 0001 833c 0005 134b a000 0020 0000 0044 0000 0000 4400 0719 0001 833c 0000 0000 4400 0719
1445400 0001 834c 0000 0000 4400 071a 0001 834c 0000 0000 4400 071b 0001 835c 0000 0000 4400 071d 0001 836c 0000 0000 4400 071e
1445460 0001 8378 0005 135d 2400 c018 0001 8388 0005 136e a000 0020 0000 0044 0000 0000 4400 0724 0001 8388 0000 0000 4400 0724
1445540 0001 8398 0000 0000 4400 0725 0001 8398 0000 0000 4400 0726 0001 83a8 0000 0000 4400 0728 0001 83b8 0000 0000 4400 0729
1445620 0001 83c4 0005 1380 2400 0018 0001 83d4 0005 1391 a000 0020 0000 0044 0000 0000 4400 072f 0001 83d4 0000 0000 4400 072f
1445700 0001 83e4 0000 000c 4400 0730 0001 83e4 0000 0000 4400 0731 0001 83f4 0000 0000 4400 0733 0001 8404 0000 0000 4400 0734
1445760 0001 8410 0005 13a3 2400 0001 0001 8420 0005 13b3 a000 0020 0000 0044 0000 0000 4400 073a 0001 8420 0000 0000 4400 073a
1446040 0001 8430 0000 0000 4400 073b 0001 8430 0000 0000 4400 073c 0001 8440 0000 0000 4400 073e 0001 8450 0000 0000 4400 073f
1446120 0001 845c 0005 13c5 2400 0004 0001 846c 0005 13d5 a000 0001 0000 0044 0005 13e2 a000 0001 0000 0048 0005 13ef a000 0004
1446200 0000 004c 0005 13fd a000 0004 0000 0050 0000 0000 4400 074b 0001 846c 0000 0000 4400 074b 0001 8488 0005 140b 8000 0014
1446260 ffff fffc 0005 1414 8000 0010 ffff fff6 0005 1420 8000 0001 ffff ff73 0005 1440 8000 0001 ffff fef8 0005 1451 8000 0001
1446340 ffff feec 0005 145f 8000 0004 ffff fee8 0005 146b 8000 0004 ffff fee4 0000 0000 c000 0002 0000 4358 0000 0000 4400 0757
1446420 0001 8488 0000 0000 4400 0758 0001 8498 0000 0000 4400 0759 0001 84ac 0000 0000 4400 075a 0001 84bc 0000 0000 4400 075b
1446500 0001 84c4 0000 0000 4400 075d 0001 84e8 0000 0000 4400 075f 0001 84f8 0000 0000 4400 0760 0001 8524 0000 0000 4400 0762
1446560 0001 852c 0000 0000 4400 0766 0001 8564 0000 0000 4400 0767 0001 85d8 0000 0000 4400 0769 0001 85e0 0000 0000 4400 076b
1446640 0001 8658 0000 0000 4400 076c 0001 866c 0000 0000 4400 076e 0001 8690 0000 0000 4400 0770 0001 86a4 0000 0000 4400 0773
1446720 0001 86c0 0000 0000 4400 0779 0001 86dc 0000 0000 4400 077a 0001 8700 0000 0000 4400 077c 0001 8728 0000 0000 4400 077d
1447000 0001 8748 0000 0000 4400 077c 0001 8760 0000 0000 4400 077e 0001 8774 0000 0000 4400 0780 0001 87d4 0000 0000 4400 0781
1447060 0001 87a4 0000 0000 4400 0780 0001 87bc 0000 0000 4400 0782 0001 87d0 0000 0000 4400 0784 0001 87e0 0000 0000 4400 0789
1447140 0001 87ec 0000 0000 4400 078b 0001 87f8 0000 0000 e000 0002 0000 46d0 0000 0000 4400 078c 0001 8800 0005 1473 2400 0001
1447220 0001 8810 0005 1481 a000 0001 0000 0044 0000 0000 4400 0793 0001 8810 0000 0000 4400 0793 0001 8820 0005 148e 2800 0001
1447300 0004 a274 0000 0000 4400 0794 0001 8820 0005 149b 8000 0004 ffff fffc 0000 0000 c000 0002 0000 46f0 0000 0000 4400 0797
1447360 0001 8820 0000 0000 4400 0798 0001 8824 0000 0000 4400 079a 0001 883c 0000 0000 4400 079c 0001 8854 0000 0000 4400 079d
1447440 0001 8874 0000 0000 4400 079e 0001 888c 0000 0000 4400 07a1 0001 8818 0000 0000 4400 07a3 0001 88e0 0000 0000 4400 07a5
1447520 0001 88f0 0000 0000 e000 0002 0000 47d0 0000 0000 4400 07a6 0001 8900 0005 14a3 2400 0001 0001 8910 0005 14b0 a000 0001
1447600 0000 0044 0005 14bd a000 0004 0000 0048 0000 0000 4400 07af 0001 8910 0000 0000 4400 07af 0001 8924 0005 14ce 2800 0001
1447660 0004 a2f4 0000 0000 4400 07b0 0001 8924 0000 0000 c000 0002 0000 47f4 0000 0000 4400 07b2 0001 8924 0000 0000 4400 07b3
1447740 0001 8930 0000 0000 4400 07b5 0001 8964 0000 0000 e000 0002 0000 4844 0000 0000 4400 07b6 0001 8974 0005 14dc 2400 0004
1450020 0001 8984 0005 14ec a000 0001 0000 0044 0005 14f8 a000 0004 0000 0048 0000 0000 4400 07bd 0001 8984 0000 0000 4400 07bd
1450100 0001 8998 0005 1509 8000 0004 ffff fffc 0000 0000 4400 07be 0001 8998 0005 1513 8000 0001 ffff fff8 0000 0000 c000 0002
1450160 0000 4874 0000 0000 4400 07c1 0001 89a4 0000 0000 4400 07c3 0001 89d0 0000 0000 4400 07c4 0001 89e8 0000 0000 4400 07c5
1450240 0001 89fc 0000 0000 4400 07c1 0001 8a10 0000 0000 4400 07c7 0001 8a24 0000 0000 4400 07c8 0001 8a4c 0000 0000 4400 07c9
1450320 0001 8a74 0000 0000 4400 07ca 0001 8a9c 0000 0000 4400 07cb 0001 8ac4 0000 0000 4400 07cc 0001 8aec 0000 0000 4400 07cd
1450400 0001 8b08 0000 0000 4400 07cf 0001 8b18 0000 0000 e000 0002 0000 49f4 0000 0000 4400 07d0 0001 8b24 0005 151d 2400 0001
1450460 0001 8b34 0005 1539 a000 0004 0000 0044 0005 1547 a000 0001 0000 0048 0005 1553 a000 0001 0000 004c 0000 0000 4400 07d9
1450540 0001 8b34 0000 0000 4400 07d9 0001 8b4c 0005 1564 8000 0004 ffff fffc 0005 1574 8000 0004 ffff fff8 0005 157c 8000 0004
1450620 ffff fff4 0005 1584 2800 0001 0004 a374 0000 0000 4400 07db 0001 8b4c 0005 1593 8000 0001 ffff ff74 0005 15a4 8000 0004
1450700 ffff ff70 0000 0000 c000 0002 0000 4a1c 0000 0000 4400 07df 0001 8b4c 0000 0000 4400 07e1 0001 8b50 0000 0000 4400 07e2
1450760 0001 8b80 0000 0000 4400 07e3 0001 8bac 0000 0000 4400 07e5 0001 8bbc 0000 0000 4400 07e8 0001 8bc0 0000 0000 4400 07ea
1451040 0001 8bfc 0000 0000 4400 07ec 0001 8c20 0000 0000 4400 07ed 0001 8c2c 0000 0000 4400 07ee 0001 8c38 0000 0000 4400 07ef
1451120 0001 8c48 0000 0000 4400 07f0 0001 8c50 0000 0000 4400 07f1 0001 8c6c 0000 0000 4400 07df 0001 8c7c 0000 0000 e000 0002
1451200 0000 4b60 0000 0000 4400 07f3 0001 8c90 0005 15b0 2400 0004 0001 8ca0 0005 15be a000 0001 0000 0044 0005 15ca a000 0001
1451260 0000 0048 0005 15d6 a000 0001 0000 004c 0000 0000 4400 07f7 0001 8ca0 0000 0000 4400 07f7 0001 8cb8 0005 15e6 8000 0004
```

```
1451340  ffff fffc 0005 15ef 8000 0004 ffff fff8 0005 15fc 8000 0014 ffff fff4 0005 1608 8000 0014 ffff fff0 0005 1617 8000 0014
1451420  ffff ffec 0005 1623 8000 0010 ffff ffe8 0005 162f 8000 0001 ffff ffe4 0000 0000 c000 0002 0000 4b88 0000 0000 4400 07ff
1451500  0001 8cb8 0000 0000 4400 0800 0001 8cd8 0000 0000 4400 0802 0001 8ce4 0000 0000 4400 0803 0001 8cfc 0000 0000 4400 0805
1451560  0001 8d08 0000 0000 4400 0806 0001 8d28 0000 0000 4400 0807 0001 8d30 0000 0000 4400 0808 0001 8d48 0000 0000 4400 080a
1451640  0001 8d70 0000 0000 4400 080b 0001 8d80 0000 0000 4400 080c 0001 8d9c 0000 0000 4400 0812 0001 8da8 0000 0000 4400 0816
1451720  0001 8e04 0000 0000 4400 0818 0001 8e14 0000 0000 4400 081a 0001 8e28 0000 0000 4400 081b 0001 8e44 0000 0000 4400 081e
1452000  0001 8e50 0000 0000 4400 081f 0001 8e80 0000 0000 4400 0821 0001 8e98 0000 0000 4400 0823 0001 8ed0 0000 0000 4400 0826
1452060  0001 8ee4 0000 0000 4400 0827 0001 8f14 0000 0000 4400 082a 0001 8f34 0000 0000 4400 082c 0001 8f44 0000 0000 4400 082f
1452140  0001 8f4c 0000 0000 4400 0830 0001 8f78 0000 0000 4400 0832 0001 8f8c 0000 0000 e000 0002 0000 4e68 0000 0000 4400 0833
1452220  0001 8f98 0005 1639 2400 0001 0001 8fa8 0005 1649 a000 0004 0000 0044 0005 1653 a000 0004 0000 0048 0000 0000 4400 0838
1452300  0001 8fad 0000 0000 4400 0838 0001 8fbc 0005 1660 8000 0004 ffff fffc 0005 166d 8000 0001 ffff ffac 0005 1690 8000 0001
1452360  ffff ffa8 0005 169f 8000 0004 ffff ffa4 0005 16a7 8000 0004 ffff ffa0 0000 0000 c000 0002 0000 4edc 0000 0000 4400 083e
1452440  0001 8fbc 0000 0000 4400 083f 0001 8fd0 0000 0000 4400 0840 0001 8fd8 0000 0000 4400 0841 0001 9004 0000 0000 4400 0843
1452520  0001 9010 0000 0000 4400 0844 0001 9014 0000 0000 4400 0845 0001 9030 0000 0000 4400 0847 0001 9054 0000 0000 4400 0849
1452600  0001 9060 0000 0000 4400 084a 0001 9080 0000 0000 4400 084c 0001 9090 0000 0000 e000 0002 0000 4f6c 0000 0000 4400 084d
1452660  0001 909c 0005 16af 2400 0004 0001 90ac 0005 16c0 a000 0004 0000 0044 0005 16cb a000 0001 0000 0048 0005 16d9 a000 0004
1452740  0000 004c 0005 16e4 a000 0001 0000 0050 0000 0000 4400 085c 0001 90ac 0000 0000 4400 085c 0001 90c8 0005 16f2 8000 0004
1453020  ffff fffc 0005 16fd 8000 0004 ffff fff8 0005 1708 8000 0010 ffff fff4 0005 1716 8000 0010 ffff fff0 0005 1724 8000 0001
1453100  ffff ffec 0005 1731 8000 0001 ffff ffe8 0005 173e 8000 0004 ffff ffe4 0000 0000 c000 0002 0000 4f98 0000 0000 4400 0862
1453160  0001 90c8 0000 0000 4400 0863 0001 90e4 0000 0000 4400 0864 0001 90f8 0000 0000 4400 0866 0001 9108 0000 0000 4400 0867
1453240  0001 9124 0000 0000 4400 0868 0001 9138 0000 0000 4400 086a 0001 9148 0000 0000 4400 086c 0001 9170 0000 0000 4400 086d
1453320  0001 917c 0000 0000 4400 086e 0001 9138 0000 0000 4400 0870 0001 9194 0000 0000 4400 0872 0001 91bc 0000 0000 4400 0873
1453400  0001 91c8 0000 0000 4400 0874 0001 9134 0000 0000 4400 0875 0001 91e0 0000 0000 4400 0877 0001 91ec 0000 0000 4400 0878
1453460  0001 91f8 0000 0000 4400 087a 0001 9204 0000 0000 4400 087b 0001 9214 0000 0000 4400 087d 0001 9220 0000 0000 4400 087e
1453540  0001 9230 0000 0000 4400 0880 0001 923c 0000 0000 4400 0881 0001 9260 0000 0000 4400 0882 0001 926c 0000 0000 4400 0884
1453620  0001 9278 0000 0000 4400 0885 0001 9288 0000 0000 4400 0887 0001 9294 0000 0000 4400 0888 0001 92a4 0000 0000 4400 088a
1453700  0001 92b0 0000 0000 e000 0002 0000 518c 0000 0000 4400 088b 0001 92bc 0005 174f 0400 0000 0001 92d0 0005 1758 0600 0000
1453760  0003 ed5c 0005 1762 0600 0000 0003 eddc 0005 1769 0600 0000 0003 ed9c 0005 1774 0600 0000 0003 ed18 0005 177b 6400 0000
1454040  0001 92d0 0005 17a2 6400 0000 0001 92d0 0005 17ab 8000 0000 0000 0000 0005 17d5 8000 0000 0000 0000 0005 17ef 8000 0000
1454120  0000 0000 0005 181a 8000 0000 0000 0000 0005 183c 8000 0000 0000 0000 0005 185f 8000 0000 0000 0000 0005 1885 8000 0000
1454200  0000 0000 0005 18a7 8000 0000 0000 0000 0005 18c8 8000 0000 0000 0000 0005 18e1 8000 0000 0000 0000 0005 18fc 8000 0000
1454260  0000 0000 0005 1910 8000 0000 0000 0000 0005 1922 2600 0001 0003 ed18 0005 1943 c200 0000 0000 0ff2 0005 1959 8200 0000
1454340  0000 1cf1 0005 1963 8400 0000 0001 92d0 0005 196e 2600 0001 0003 ed5c 0005 1991 8000 0010 ffff fb05 0005 1a01 8000 0010
1454420  ffff fb05 0000 0000 a200 0000 0000 0000 0005 1a11 8200 0000 0000 1b24 0005 1a1d 8400 0000 0001 92d0 0005 1a29 2600 0001
1454500  0003 ed9c 0005 1a4d 8200 0000 0000 2882 0005 1a6f 8400 0000 0001 92d0 0005 1a91 2600 0001 0003 eddc 0005 1ab1 8000 0001
1454560  ffff fb05 0005 1b33 8000 0004 ffff fb05 0005 1b42 8000 0004 ffff fb05 0005 1b72 8000 0004 ffff fb05 0000 0000 a200 0000
1454640  0000 0000 0005 1b92 2000 0004 0000 0000 0005 1ba7 2000 0004 0000 0000 0005 1bb7 2000 0004 0000 0000 0000 0000 a200 0000
1454720  0000 0000 0005 1bd6 2400 0004 0001 92d0 0005 1be5 a000 0001 0000 0044 0005 1bef a000 0001 0000 0048 0005 1bf9 8400 0000
1455000  0001 92d0 0000 0000 4400 005a 0001 92d0 0005 1c02 4000 0001 0000 0018 0005 1c0c 4000 0001 0000 0019 0000 0000 4400 005a
1455060  0001 92dc 0000 0000 4400 005c 0001 92dc 0000 0000 4400 005d 0001 92f9 0000 0000 4400 005e 0001 9314 0000 0000 4400 0060
1455140  0001 9328 0000 0000 4400 0061 0001 9334 0005 1c16 2400 0004 0001 9344 0005 1c25 a000 0001 0000 0044 0005 1c2e a000 0001
1455220  0000 0048 0005 1c3b a000 0004 0000 004c 0000 0000 4400 0073 0001 9344 0005 1c4c 4000 0001 0000 0018 0005 1c55 4000 0001
1455300  0000 0019 0005 1c62 4000 0004 0000 001a 0000 0000 4400 0073 0001 9350 0000 0000 4400 0075 0001 9350 0000 0000 4400 0077
1455360  0001 938c 0000 0000 4400 0078 0001 93b0 0005 1c73 8200 0000 0000 5aa4 0005 1c8c 8200 0000 0000 0000 0000 0000 a200 0000
1455440  0000 0000 0005 1ca9 8000 0001 ffff fb05 0005 1cb7 8000 0002 ffff fb05 0005 1cc6 8000 0004 ffff fb05 0005 1cd3 8000 0004
1455520  ffff fb05 0005 1ce1 8000 0002 ffff fb05 0005 1cef 8000 0004 ffff fb05 0005 1cfb 8000 0004 ffff fb05 0005 1d2e 8000 0004
1455600  ffff fb05 0005 1d44 8000 0008 ffff fb05 0005 1d78 8000 0008 ffff fb05 0005 1d87 8000 0008 ffff fb05 0005 1da7 8000 0008
1455660  ffff fb05 0005 1db3 8000 0004 ffff fb05 0005 1dc2 8000 0001 ffff fb05 0005 1dd1 8000 0004 ffff fb05 0005 1dde 8000 0004
1455740  ffff fb05 0005 1ded 8000 0004 ffff fb05 0005 1dfb 8000 0004 ffff fb05 0005 1e09 8000 0002 ffff fb05 0005 1e16 8000 0004
1456020  ffff fb05 0005 1e23 8000 0002 ffff fb05 0005 1e30 8000 0002 ffff fb05 0005 1e3d 8000 0004 ffff fb05 0005 1e4a 8000 0004
1456100  ffff fb05 0005 1e59 8000 0020 ffff fb05 0005 1e93 8000 0020 ffff fb05 0005 1ea1 8000 0001 ffff fb05 0000 0000 a200 0000
1456160  0000 0000 0005 1eaf 8200 0000 0000 2509 0005 1ec7 8000 0008 ffff fb05 0005 1f00 8000 0008 ffff fb05 0005 1f45 8000 0010
1456240  ffff fb05 0005 1f87 8200 0000 0000 225a 0005 1f9b 8000 002c ffff fb05 0005 204a 8000 002c ffff fb05 0000 0000 a200 0000
1456320  0000 0000 0000 0000 a200 0000 0000 0000 0005 208e 8200 0000 0000 1276 0005 20a7 8000 0010 ffff fb05 0000 0000 a200 0000
1456400  0000 0000 0005 2110 8200 0000 0000 0e0c 0005 2129 8000 000c ffff fb05 0000 0000 a200 0000 0000 0000 0005 2189 8200 0000
```

| | | | | | | | | | | | | | | | | | | | | | | | | |
|---|---|---|---|---|---|---|---|---|---|---|---|---|---|---|---|---|---|---|---|---|---|---|---|---|
| 1456460 | 0000 | 0000 | 0005 | 21a1 | a200 | 0000 | 0000 | 1223 | 0005 | 21bd | 8000 | 0010 | ffff | fb05 | 0000 | 0000 | a200 | 0000 | 0000 | 0000 | 0000 | 0000 | a200 | 0000 |
| 1456540 | 0000 | 0000 | 0005 | 2242 | 8200 | 0000 | 0000 | 38aa | 0005 | 225a | 8000 | 0040 | ffff | fb05 | 0005 | 230b | 8000 | 0040 | ffff | fb05 | 0000 | 0000 | a200 | 0000 |
| 1456620 | 0000 | 0000 | 0005 | 23da | 2400 | 0004 | 0001 | 93c0 | 0000 | 0000 | 4400 | 0181 | 0001 | 93c0 | 0000 | 0000 | 4400 | 0181 | 0001 | 93cc | 0005 | 23e3 | 8000 | 0010 |
| 1456700 | ffff | fff0 | 0005 | 23f7 | 8000 | 0004 | ffff | ffec | 0000 | 0000 | c000 | 0002 | 0000 | 00fc | 0000 | 0000 | 4400 | 0187 | 0001 | 93cc | 0000 | 0000 | 4400 | 018e |
| 1456760 | 0001 | 93d8 | 0000 | 0000 | 4400 | 0190 | 0001 | 93f8 | 0000 | 0000 | 4400 | 0191 | 0001 | 9424 | 0000 | 0000 | e000 | 0002 | 0000 | 0160 | 0000 | 0000 | 4400 | 0192 |
| 1457040 | 0001 | 9430 | 0005 | 2405 | 2400 | 0004 | 0001 | 9440 | 0000 | 0000 | 4400 | 019b | 0001 | 9440 | 0000 | 0000 | 4400 | 019b | 0001 | 944c | 0005 | 2414 | 8000 | 000c |
| 1457120 | ffff | fff4 | 0000 | 0000 | c000 | 0002 | 0000 | 017c | 0000 | 0000 | 4400 | 01a0 | 0001 | 944c | 0000 | 0000 | 4400 | 01a2 | 0001 | 9458 | 0000 | 0000 | e000 | 0002 |
| 1457200 | 0000 | 01b8 | 0000 | 0000 | 4400 | 01a3 | 0001 | 9488 | 0005 | 2425 | 2400 | 0001 | 0001 | 9498 | 0000 | 0000 | 4400 | 01ac | 0001 | 9498 | 0000 | 0000 | 4400 | 01ac |
| 1457260 | 0001 | 94a4 | 0005 | 2432 | 8000 | 0001 | ffff | fffc | 0005 | 243d | 8000 | 0004 | ffff | fff8 | 0005 | 244a | 2600 | 0004 | 0003 | ee18 | 0000 | 0000 | c000 | 0002 |
| 1457340 | 0000 | 0104 | 0000 | 0000 | 4400 | 01b3 | 0001 | 94a4 | 0000 | 0000 | 4400 | 01b4 | 0001 | 94b8 | 0000 | 0000 | 4400 | 01b5 | 0001 | 94c8 | 0000 | 0000 | 4400 | 01b7 |
| 1457420 | 0001 | 94d4 | 0000 | 0000 | e000 | 0002 | 0000 | 0210 | 0000 | 0000 | 4400 | 01b8 | 0001 | 94e0 | 0005 | 2456 | 2400 | 0001 | 0001 | 94f0 | 0005 | 2464 | a000 | 0001 |
| 1457500 | 0000 | 0044 | 0000 | 0000 | 4400 | 01c1 | 0001 | 94f0 | 0000 | 0000 | 4400 | 01c1 | 0001 | 9500 | 0005 | 2472 | 8000 | 0004 | ffff | fffc | 0000 | 0000 | 4400 | 01c3 |
| 1457560 | 0001 | 9500 | 0005 | 247e | 8000 | 002c | ffff | fff8 | 0000 | 0000 | c000 | 0002 | 0000 | 0234 | 0000 | 0000 | 4400 | 01c6 | 0001 | 9504 | 0000 | 0000 | 4400 | 01c7 |
| 1457640 | 0001 | 9510 | 0000 | 0000 | 4400 | 01c8 | 0001 | 9520 | 0000 | 0000 | 4400 | 01ca | 0001 | 9520 | 0000 | 0000 | 4400 | 01cb | 0001 | 9570 | 0000 | 0000 | 4400 | 01cc |
| 1457720 | 0001 | 9578 | 0000 | 0000 | e000 | 0002 | 0000 | 02b4 | 0000 | 0000 | 4400 | 01cd | 0001 | 9584 | 0005 | 2492 | 2400 | 0010 | 0001 | 9594 | 0005 | 24a7 | a000 | 0001 |
| 1460000 | 0000 | 0044 | 0005 | 24b3 | a000 | 0001 | 0000 | 0048 | 0005 | 24bf | a000 | 0014 | 0000 | 004c | 0005 | 24d7 | a000 | 0004 | 0000 | 0050 | 0000 | 0000 | 4400 | 01dd |
| 1460060 | 0001 | 9594 | 0000 | 0000 | 4400 | 01dd | 0001 | 95b0 | 0005 | 24e8 | 8000 | 0010 | ffff | fffc | 0005 | 24f4 | 8000 | 0004 | ffff | fff8 | 0005 | 24fd | 8000 | 0040 |
| 1460140 | ffff | fff4 | 0005 | 2510 | 8000 | 0004 | ffff | fff0 | 0000 | 0000 | 4400 | 01e1 | 0001 | 95b0 | 0005 | 251c | 8000 | 0004 | ffff | ffec | 0005 | 2529 | 8000 | 002c |
| 1460220 | ffff | ffe8 | 0005 | 2536 | 8000 | 0001 | ffff | ffd8 | 0005 | 2559 | 8000 | 0001 | ffff | ffc8 | 0005 | 2566 | 8000 | 0001 | ffff | ff48 | 0005 | 2586 | 8000 | 0004 |
| 1460300 | ffff | ff44 | 0000 | 0000 | c000 | 0002 | 0000 | 02e4 | 0000 | 0000 | 4400 | 01e9 | 0001 | 95b4 | 0000 | 0000 | 4400 | 01ea | 0001 | 95c8 | 0000 | 0000 | 4400 | 01eb |
| 1460360 | 0001 | 95d0 | 0000 | 0000 | 4400 | 01ec | 0001 | 9518 | 0000 | 0000 | 4400 | 01ed | 0001 | 95e0 | 0000 | 0000 | 4400 | 01ef | 0001 | 95e8 | 0000 | 0000 | 4400 | 01f2 |
| 1460440 | 0001 | 95f8 | 0000 | 0000 | 4400 | 01f4 | 0001 | 960c | 0000 | 0000 | 4400 | 01f6 | 0001 | 9628 | 0000 | 0000 | 4400 | 01f7 | 0001 | 9634 | 0000 | 0000 | 4400 | 01f8 |
| 1460520 | 0001 | 964c | 0000 | 0000 | 4400 | 01fa | 0001 | 9650 | 0000 | 0000 | 4400 | 01fb | 0001 | 9660 | 0000 | 0000 | 4400 | 01fc | 0001 | 966c | 0000 | 0000 | 4400 | 01fd |
| 1460600 | 0001 | 967c | 0000 | 0000 | 4400 | 01ff | 0001 | 967c | 0000 | 0000 | 4400 | 0200 | 0001 | 96cc | 0000 | 0000 | 4400 | 0204 | 0001 | 96d8 | 0000 | 0000 | 4400 | 0205 |
| 1460660 | 0001 | 96ec | 0000 | 0000 | 4400 | 0209 | 0001 | 9700 | 0000 | 0000 | 4400 | 020a | 0001 | 9724 | 0000 | 0000 | 4400 | 020c | 0001 | 9738 | 0000 | 0000 | 4400 | 020d |
| 1460740 | 0001 | 975c | 0000 | 0000 | 4400 | 021a | 0001 | 9770 | 0000 | 0000 | e000 | 0002 | 0000 | 04ac | 0000 | 0000 | 4400 | 021b | 0001 | 977c | 0005 | 258f | 2400 | 0004 |
| 1461020 | 0001 | 978c | 0005 | 259e | a000 | 0001 | 0000 | 0044 | 0000 | 0000 | 4400 | 0228 | 0001 | 978c | 0000 | 0000 | 4400 | 0228 | 0001 | 979c | 0005 | 25ae | 8000 | 0014 |
| 1461100 | ffff | fffc | 0005 | 25b8 | 8000 | 0004 | ffff | fff8 | 0000 | 0000 | c000 | 0002 | 0000 | 04cc | 0000 | 0000 | 4400 | 022c | 0001 | 979c | 0000 | 0000 | 4400 | 022d |
| 1461160 | 0001 | 97ac | 0000 | 0000 | 4400 | 022f | 0001 | 97b8 | 0000 | 0000 | 4400 | 0230 | 0001 | 97d0 | 0000 | 0000 | 4400 | 0231 | 0001 | 97e0 | 0000 | 0000 | 4400 | 0233 |
| 1461240 | 0001 | 97ec | 0000 | 0000 | 4400 | 0235 | 0001 | 97f8 | 0000 | 0000 | 4400 | 0237 | 0001 | 9808 | 0000 | 0000 | 4400 | 0238 | 0001 | 9818 | 0000 | 0000 | 4400 | 0239 |
| 1461320 | 0001 | 982c | 0000 | 0000 | e000 | 0002 | 0000 | 0568 | 0000 | 0000 | 4400 | 023a | 0001 | 9838 | 0005 | 25c1 | 0400 | 0000 | 0001 | 9848 | 0005 | 25ca | 0600 | 0000 |
| 1461400 | 0003 | f058 | 0005 | 25d4 | 0600 | 0000 | 0003 | ef58 | 0005 | 25de | 0600 | 0000 | 0003 | ef18 | 0005 | 25e8 | 0600 | 0000 | 0003 | eed8 | 0005 | 25f2 | 0600 | 0000 |
| 1461460 | 0003 | f01c | 0005 | 25f9 | 0600 | 0000 | 0003 | f098 | 0005 | 2604 | 0600 | 0000 | 0003 | efdc | 0005 | 260f | 0600 | 0000 | 0003 | ef98 | 0005 | 261a | 0600 | 0000 |
| 1461540 | 0003 | ee98 | 0005 | 2621 | 6400 | 0000 | 0001 | 9848 | 0005 | 2648 | 6400 | 0000 | 0001 | 9848 | 0005 | 2651 | 8000 | 0000 | 0000 | 0000 | 0005 | 267b | 8000 | 0000 |
| 1461620 | 0000 | 0000 | 0005 | 2695 | 8000 | 0000 | 0000 | 0000 | 0005 | 26c0 | 8000 | 0000 | 0000 | 0000 | 0005 | 26e2 | 8000 | 0000 | 0000 | 0000 | 0005 | 2705 | 8000 | 0000 |
| 1461700 | 0000 | 0000 | 0005 | 272b | 8000 | 0000 | 0000 | 0000 | 0005 | 274d | 8000 | 0000 | 0000 | 0000 | 0005 | 276e | 8000 | 0000 | 0000 | 0000 | 0005 | 2787 | 8000 | 0000 |
| 1461760 | 0000 | 0000 | 0005 | 27a2 | 8000 | 0000 | 0000 | 0000 | 0005 | 27b6 | 8000 | 0000 | 0000 | 0000 | 0005 | 27c8 | 2600 | 0001 | 0003 | ee98 | 0005 | 27e9 | c200 | 0000 |
| 1462040 | 0000 | 0ff2 | 0005 | 27fe | 8200 | 0000 | 0000 | 1cf1 | 0005 | 2809 | 8400 | 0000 | 0001 | 9848 | 0005 | 2814 | 2600 | 0001 | 0003 | eed8 | 0005 | 2837 | 8000 | 0010 |
| 1462120 | ffff | fb05 | 0005 | 28a7 | 8000 | 0010 | ffff | fb05 | 0000 | 0000 | a200 | 0000 | 0000 | 0000 | 0005 | 28b7 | 8200 | 0000 | 0000 | 0786 | 0005 | 28c2 | 8400 | 0000 |
| 1462200 | 0001 | 9848 | 0005 | 28cd | 2600 | 0001 | 0003 | ef18 | 0000 | 0000 | a200 | 0000 | 0000 | 0000 | 0005 | 28f0 | 8200 | 0000 | 0000 | 0796 | 0005 | 28fb | 8400 | 0000 |
| 1462260 | 0001 | 9848 | 0005 | 2906 | 2600 | 0001 | 0003 | ef58 | 0005 | 2929 | 8200 | 0000 | 0000 | 0874 | 0005 | 2935 | 8400 | 0000 | 0001 | 9848 | 0005 | 2941 | 2600 | 0001 |
| 1462340 | 0003 | ef98 | 0005 | 2965 | 8200 | 0000 | 0000 | 0000 | 0005 | 2971 | 8200 | 0000 | 0000 | 1a14 | 0005 | 297d | 8400 | 0000 | 0001 | 9848 | 0005 | 2989 | 2600 | 0001 |
| 1462420 | 0003 | efdc | 0005 | 299b | 8200 | 0000 | 0000 | 2882 | 0005 | 29bd | 8400 | 0000 | 0001 | 9848 | 0005 | 29df | 2600 | 0001 | 0003 | f01c | 0005 | 29ff | 8000 | 0001 |
| 1462500 | ffff | fb05 | 0005 | 2a81 | 8000 | 0004 | ffff | fb05 | 0005 | 2a90 | 8000 | 0004 | ffff | fb05 | 0005 | 2ac0 | 8000 | 0004 | ffff | fb05 | 0000 | 0000 | a200 | 0000 |
| 1462560 | 0000 | 0000 | 0005 | 2ae0 | 2000 | 0004 | 0000 | 0000 | 0005 | 2af5 | 2000 | 0004 | 0000 | 0000 | 0005 | 2b05 | 2000 | 0004 | 0000 | 0000 | 0000 | 0000 | a200 | 0000 |
| 1462640 | 0000 | 0000 | 0000 | 0000 | a200 | 0000 | 0000 | 0000 | 0005 | 2b24 | 8200 | 0000 | 0000 | 067a | 0005 | 2b2f | 8400 | 0000 | 0001 | 9848 | 0005 | 2b3a | 2600 | 0001 |
| 1462720 | 0003 | f058 | 0000 | 0000 | a200 | 0000 | 0000 | 0000 | 0000 | 0000 | a200 | 0000 | 0000 | 0000 | 0005 | 2b4a | 8200 | 0000 | 0000 | 0000 | 0000 | 0000 | a200 | 0000 |
| 1463000 | 0000 | 0000 | 0005 | 2b56 | 8200 | 0000 | 0000 | 0bf9 | 0005 | 2b62 | 8400 | 0000 | 0001 | 9848 | 0005 | 2b6e | 2600 | 0001 | 0003 | f098 | 0005 | 2b7f | c200 | 0000 |
| 1463060 | 0000 | 0000 | 0005 | 2b8b | 8200 | 0000 | 0000 | 07e7 | 0005 | 2bad | 8000 | 0004 | ffff | fb05 | 0000 | 0000 | a200 | 0000 | 0000 | 0000 | 0005 | 2bde | 8000 | 0004 |
| 1463140 | ffff | fb05 | 0000 | 0000 | a200 | 0000 | 0000 | 0000 | 0000 | 0000 | a200 | 0000 | 0000 | 0000 | 0005 | 2bf1 | 2400 | 0001 | 0001 | 9848 | 0005 | 2bff | a000 | 0001 |
| 1463220 | 0000 | 0044 | 0005 | 2c13 | 8400 | 0000 | 0001 | 9848 | 0000 | 0000 | 4400 | 001b | 0001 | 9848 | 0000 | 0000 | 4400 | 001b | 0001 | 9858 | 0005 | 2c1c | 8000 | 0001 |
| 1463300 | ffff | ff7c | 0005 | 2c3f | 8000 | 0001 | ffff | fef8 | 0005 | 2c4f | 8000 | 0001 | ffff | fdf8 | 0005 | 2c6e | 8000 | 0001 | ffff | fdf4 | 0005 | 2c87 | 2600 | 0004 |
| 1463360 | 0003 | f0d4 | 0005 | 2c97 | 8000 | 0004 | ffff | fdf0 | 0005 | 2ca5 | 8000 | 0014 | ffff | fdec | 0000 | 0000 | c000 | 0002 | 0000 | 0240 | 0000 | 0000 | 4400 | 0034 |
| 1463440 | 0001 | 9858 | 0000 | 0000 | 4400 | 0036 | 0001 | 986c | 0000 | 0000 | 4400 | 0038 | 0001 | 9894 | 0000 | 0000 | 4400 | 0039 | 0001 | 9894 | 0000 | 0000 | 4400 | 003a |
| 1463520 | 0001 | 98b8 | 0000 | 0000 | 4400 | 003d | 0001 | 98c4 | 0000 | 0000 | 4400 | 003e | 0001 | 98d4 | 0000 | 0000 | 4400 | 0040 | 0001 | 98ec | 0000 | 0000 | 4400 | 0041 |

```
1463600  0001 990c 0000 0000 4400 0042 0001 9934 0000 0000 4400 0043 0001 9954 0000 0000 4400 0049 0001 9960 0000 0000 4400 004a
1463660  0001 9980 0000 0000 4400 004b 0001 9990 0000 0000 4400 004e 0001 99b4 0000 0000 4400 0056 0001 99c0 0000 0000 4400 0057
1463740  0001 99e8 0000 0000 4400 005b 0001 99f4 0000 0000 4400 005c 0001 99f4 0000 0000 4400 005d 0001 9a18 0000 0000 e000 0002
1464020  0000 01dc 0000 0000 4400 005f 0001 9a24 0005 2cb6 0400 0000 0001 9a38 0005 2cc0 0600 0000 0003 f1d0 0005 2cc7 0600 0000
1464100  0003 f190 0005 2cce 0400 0000 0001 9e88 0005 2cde c600 0000 0003 f20c 0005 2ce7 6400 0000 0001 9a38 0005 2d0e 6400 0000
1464160  0001 9a39 0005 2d18 8000 0000 0000 0000 0005 2d42 8000 0000 0000 0000 0005 2d5c 8000 0000 0000 0000 0005 2d87 8000 0000
1464240  0000 0000 0005 2da9 8000 0000 0000 0000 0005 2dcc 8000 0000 0000 0000 0005 2df2 8000 0000 0000 0000 0005 2e14 8000 0000
1464320  0000 0000 0005 2e35 8000 0000 0000 0000 0005 2e4e 8000 0000 0000 0000 0005 2e69 8000 0000 0000 0000 0005 2e7d 8000 0000
1464400  0000 0000 0005 2e8f 2600 0001 0003 f190 0005 2eb0 8200 0000 0000 2882 0005 2ed2 8400 0000 0001 9a38 0005 2ef4 2600 0001
1464460  0003 f1d0 0005 2f14 8000 0001 ffff fb05 0005 2f96 8000 0004 ffff fb05 0005 2fa5 8000 0004 ffff fb05 0005 2fd5 8000 0004
1464540  ffff fb05 0000 0000 a200 0000 0000 0000 0005 2ff5 c200 0000 0000 07e7 0005 3017 8000 0008 ffff fb05 0005 3063 8000 0008
1464620  ffff fb05 0005 3075 2400 0000 0001 9a38 0005 3089 a000 0008 0000 0044 0005 30a2 8400 0000 0001 9a38 0000 0000 4400 0014
1464700  0001 9a38 0000 0000 4400 0014 0001 9a48 0000 0000 4400 0015 0001 9a48 0000 0000 4400 0016 0001 9a58 0000 0000 4400 0017
1464760  0001 9a64 0005 30ac 2400 0001 0001 9a6c 0005 30bf a000 0008 0000 0044 0000 0000 4400 001e 0001 9a6c 0000 0000 4400 001e
1465040  0001 9a7c 0005 30d0 8000 0008 ffff fffc 0005 30e4 4000 0001 0000 001d 0005 30f1 4000 0001 0000 001c 0005 30fc 8000 0004
1465120  ffff fff8 0000 0000 c000 0002 0000 0044 0000 0000 4400 0024 0001 9a7c 0000 0000 4400 0026 0001 9a8c 0000 0000 4400 0027
1465200  0001 9a9c 0000 0000 4400 0029 0001 9ab8 0000 0000 4400 002a 0001 9ac4 0000 0000 4400 002c 0001 9ad0 0000 0000 4400 002e
1465260  0001 9aec 0000 0000 4400 002c 0001 9afc 0000 0000 4400 0031 0001 9b10 0000 0000 4400 0033 0001 9b24 0000 0000 e000 0002
1465340  0000 00f8 0000 0000 4400 0034 0001 9b30 0005 3104 2400 0000 0001 9b40 0005 311a a000 0008 0000 0044 0000 0000 4400 003b
1465420  0001 9b40 0000 0000 4400 003b 0001 9b50 0000 0000 4400 003c 0001 9b50 0000 0000 4400 003d 0001 9b5c 0005 312b 2400 0001
1465500  0001 9b64 0005 3140 a000 0008 0000 0044 0000 0000 4400 0044 0001 9b64 0000 0000 4400 0044 0001 9b74 0005 3151 8000 0008
1465560  ffff fffc 0000 0000 c000 0002 0000 013c 0000 0000 4400 0047 0001 9b74 0000 0000 4400 0048 0001 9b84 0000 0000 4400 0049
1465640  0001 9b94 0000 0000 4400 004b 0001 9ba4 0000 0000 e000 0002 0000 0178 0000 c000 4400 004c 0001 9bb0 0005 3165 2400 0004
1465720  0001 9bc0 0005 3178 a000 0008 0000 0044 0005 318a a000 0008 0000 0048 0000 0000 4400 0054 0001 9bc0 0000 0000 4400 0054
1466000  0001 9bd4 0000 0000 4400 0055 0001 9bd4 0005 319c 4000 0001 0000 001d 0005 31a7 4000 0001 0000 001c 0005 31b2 4000 0004
1466060  0000 001b 0000 0000 c000 0003 0000 01b8 0000 0000 4400 005b 0001 9bf0 0000 0000 4400 005c 0001 9bfc 0000 0000 4400 005e
1466140  0001 9c08 0000 0000 4400 0060 0001 9c20 0000 0000 4400 0062 0001 9c44 0000 0000 4400 005e 0001 9c5c 0000 0000 4400 0066
1466220  0001 9c68 0000 0000 e000 0003 0000 023c 0000 0000 4400 006a 0001 9c74 0000 0000 4400 006c 0001 9c90 0005 31bb 2400 0004
1466300  0001 9ca0 0005 31ce a000 0008 0000 0044 0000 0000 4400 0073 0001 9ca0 0000 0000 4400 0073 0001 9cb0 0005 31e6 4000 0001
1466360  0000 001d 0005 31f7 4000 0004 0000 001c 0005 3205 4000 0004 0000 001b 0000 c000 4400 0076 0001 9cb0 0000 0000 c000 0002
1466440  0000 0284 0000 0000 4400 0078 0001 9cbc 0000 0000 4400 0079 0001 9cc8 0000 0000 4400 007b 0001 9cd4 0000 0000 4400 007d
1466520  0001 9ce8 0000 0000 4400 007f 0001 9cf8 0000 0000 4400 0080 0001 9d00 0000 0000 4400 0083 0001 9d10 0000 0000 4400 0084
1466600  0001 9d18 0000 0000 4400 0085 0001 9d20 0000 0000 4400 0086 0001 9d28 0000 0000 4400 0087 0001 9d30 0000 0000 4400 0088
1466660  0001 9d38 0000 0000 4400 0089 0001 9d40 0000 0000 4400 008a 0001 9d48 0000 0000 4400 008b 0001 9d50 0000 0000 4400 008c
1466740  0001 9d58 0000 0000 4400 008e 0001 9d60 0000 0000 e000 0002 0000 0334 0000 0000 4400 008f 0001 9d6c 0005 3210 2600 0004
1467020  0003 f20c 0005 3232 2400 0004 0001 9d7c 0005 3242 a000 0004 0000 0044 0005 3258 a000 0004 0000 0048 0005 3265 a000 0004
1467100  0000 004c 0000 0000 4400 009a 0001 9d7c 0000 0000 4400 009a 0001 9d94 0000 0000 4400 009b 0001 9d34 0000 0000 4400 009c
1467160  0001 9db4 0005 3276 2400 0004 0001 9dc4 0005 3287 a000 0004 0000 0044 0005 3296 a000 0004 0000 0048 0005 32b9 a000 0004
1467240  0000 004c 0005 32d9 a000 0004 0000 0050 0005 32e6 a000 0004 0000 0054 0000 0000 4400 00a7 0001 9dc4 0000 0000 4400 00a7
1467320  0001 9de4 0000 0000 4400 00a9 0001 9de4 0000 0000 4400 00aa 0001 9df0 0000 0000 4400 00ad 0001 9e00 0000 0000 4400 00b2
1467400  0001 9e3c 0000 0000 4400 00b5 0001 9e70 0000 0000 4400 00b6 0001 9e78 0005 32f7 2400 0004 0001 9e88 0005 330d a000 0001
1467460  0000 0044 0005 3318 a000 0004 0000 0048 0000 0000 4400 00bd 0001 9e88 0000 c000 4400 00bd 0001 9e9c 0000 0000 4400 00be
1467540  0001 9e9c 0000 0000 4400 00c0 0001 9eac 0000 0000 4400 00c4 0001 9ec0 0000 0000 4400 00c6 0001 9ecc 0005 3326 2400 0004
1467620  0001 9edc 0005 3339 a000 0001 0000 0044 0005 3344 a000 0004 0000 0048 0005 3351 a000 0001 0000 004c 0005 335c a000 0004
1467700  0000 0050 0000 0000 4400 00cf 0001 9edc 0000 0000 4400 00cf 0001 9ef8 0005 336e 8000 0008 ffff fff8 0000 0000 c000 0002
1467760  0000 04c0 0000 0000 4400 00d2 0001 9ef8 0000 0000 4400 00d3 0001 9f0c 0000 0000 4400 00d7 0001 9f14 0000 0000 e000 0002
1470040  0000 04f8 0000 0000 4400 00d8 0001 9f30 0005 337e 2400 0004 0001 9f40 0005 338e a000 0001 0000 0044 0005 33a2 a000 0004
1470120  0000 0048 0005 33af a000 0001 0000 004c 0005 33ba a000 0004 0000 0050 0000 0000 4400 00e1 0001 9f40 0000 0000 4400 00e1
1470200  0001 9f5c 0005 33cc 8000 0008 ffff fff8 0000 0000 c000 0002 0000 0524 0000 0000 4400 00e4 0001 9f5c 0000 0000 4400 00e5
1470260  0001 9f70 0000 0000 4400 00e7 0001 9f78 0000 0000 4400 00ea 0001 9f94 0000 0000 4400 00ec 0001 9fac 0000 0000 4400 00f0
1470340  0001 9fb8 0000 0000 4400 00f2 0001 9fc0 0000 0000 e000 0002 0000 0594 0000 0000 4400 00f5 0001 9fcc 0005 33dc 2400 0004
1470420  0001 9fdc 0005 33ef a000 0004 0000 0044 0005 33fc a000 0001 0000 0048 0005 3407 a000 0004 0000 004c 0000 0000 4400 00fd
1470500  0001 9fdc 0000 0000 4400 00fd 0001 9ff4 0005 3419 8000 0008 ffff fff8 0000 0000 c000 0002 0000 05bc 0000 0000 4400 0100
1470560  0001 9ff4 0000 0000 4400 0101 0001 a008 0000 0000 4400 0103 0001 a010 0000 0000 4400 0105 0001 a02c 0000 0000 4400 0107
1470640  0001 a03c 0000 0000 4400 010b 0001 a048 0000 0000 e000 0002 0000 061c 0000 0000 4400 010d 0001 a054 0005 3429 2400 0004
```

| | | | | | | | | | | | | | | | | | | | | | | | | |
|---|---|---|---|---|---|---|---|---|---|---|---|---|---|---|---|---|---|---|---|---|---|---|---|---|
| 1470720 | 0001 | a064 | 0005 | 3439 | a000 | 0004 | 0000 | 0044 | 0005 | 3446 | a000 | 0004 | 0000 | 0048 | 0000 | 0000 | 4400 | 0114 | 0001 | a064 | 0000 | 0000 | 4400 | 0114 |
| 1471000 | 0001 | a078 | 0005 | 3456 | 8000 | 0008 | ffff | fffc | 0005 | 3466 | 8000 | 0001 | ffff | fff8 | 0000 | 0000 | c000 | 0002 | 0000 | 0640 | 0005 | 3471 | 8000 | 0001 |
| 1471060 | ffff | fff4 | 0000 | 0000 | 4400 | 0118 | 0001 | a078 | 0000 | 0000 | c000 | 0003 | 0000 | 0644 | 0000 | 0000 | 4400 | 0119 | 0001 | a0a4 | 0000 | 0000 | e000 | 0003 |
| 1471140 | 0000 | 0694 | 0000 | 0000 | e000 | 0002 | 0000 | 0694 | 0000 | 0000 | 4400 | 011b | 0001 | a0cc | 0005 | 3480 | 2400 | 0004 | 0001 | a0dc | 0005 | 3494 | a000 | 0004 |
| 1471220 | 0000 | 0044 | 0000 | 0000 | 4400 | 0121 | 0001 | a0dc | 0000 | 0000 | 4400 | 0121 | 0001 | a0ec | 0000 | 0000 | 4400 | 0122 | 0001 | a0ec | 0005 | 34a1 | 2400 | 0004 |
| 1471300 | 0001 | a0fc | 0005 | 34b1 | a000 | 0004 | 0000 | 0044 | 0005 | 34c0 | a000 | 0004 | 0000 | 0048 | 0005 | 34cd | a000 | 0004 | 0000 | 004c | 0000 | 0000 | 4400 | 012a |
| 1471360 | 0001 | a0fc | 0000 | 0000 | 4400 | 012a | 0001 | a114 | 0000 | 0000 | 4400 | 012b | 0001 | a114 | 0000 | 0000 | 4400 | 012c | 0001 | a134 | 0005 | 34de | 2400 | 0004 |
| 1471440 | 0001 | a144 | 0005 | 34ef | a000 | 0004 | 0000 | 0044 | 0005 | 34fe | a000 | 0004 | 0000 | 0048 | 0005 | 351a | a000 | 0004 | 0000 | 004c | 0005 | 353a | a000 | 0004 |
| 1471520 | 0000 | 0050 | 0005 | 3547 | a000 | 0004 | 0000 | 0054 | 0000 | 0000 | 4400 | 0137 | 0001 | a144 | 0000 | 0000 | 4400 | 0137 | 0001 | a164 | 0000 | 0000 | 4400 | 0139 |
| 1471600 | 0001 | a164 | 0000 | 0000 | 4400 | 013a | 0001 | a180 | 0005 | 3558 | 2400 | 0004 | 0001 | a190 | 0005 | 356b | a000 | 0001 | 0000 | 0044 | 0005 | 3576 | a000 | 0004 |
| 1471660 | 0000 | 0048 | 0005 | 3583 | a000 | 0001 | 0000 | 004c | 0005 | 358f | a000 | 0004 | 0000 | 0050 | 0000 | 0000 | 4400 | 0143 | 0001 | a190 | 0000 | 0000 | 4400 | 0143 |
| 1471740 | 0001 | a1ac | 0000 | 0000 | 4400 | 0144 | 0001 | a1ac | 0000 | 0000 | 4400 | 0145 | 0001 | a1cc | 0005 | 35a1 | 2400 | 0004 | 0001 | a1dc | 0005 | 35b1 | a000 | 0001 |
| 1472020 | 0000 | 0044 | 0005 | 35be | a000 | 0004 | 0000 | 0048 | 0005 | 35cb | a000 | 0001 | 0000 | 004c | 0005 | 35d7 | a000 | 0004 | 0000 | 0050 | 0000 | 0000 | 4400 | 014e |
| 1472100 | 0001 | a1dc | 0000 | 0000 | 4400 | 014e | 0001 | a1f8 | 0000 | 0000 | 4400 | 014f | 0001 | a1f8 | 0000 | 0000 | 4400 | 0150 | 0001 | a218 | 0005 | 35e9 | 2400 | 0004 |
| 1472160 | 0001 | a228 | 0005 | 35fc | a000 | 0004 | 0000 | 0044 | 0005 | 3609 | a000 | 0001 | 0000 | 0048 | 0005 | 3615 | a000 | 0004 | 0000 | 004c | 0000 | 0000 | 4400 | 0158 |
| 1472240 | 0001 | a228 | 0000 | 0000 | 4400 | 0158 | 0001 | a240 | 0000 | 0000 | 4400 | 0159 | 0001 | a240 | 0000 | 0000 | 4400 | 015a | 0001 | a25c | 0005 | 3627 | 2400 | 0004 |
| 1472320 | 0001 | a26c | 0005 | 3637 | a000 | 0004 | 0000 | 0044 | 0005 | 3644 | a000 | 0004 | 0000 | 0048 | 0000 | 0000 | 4400 | 0161 | 0001 | a26c | 0000 | 0000 | 4400 | 0161 |
| 1472400 | 0001 | a280 | 0000 | 0000 | 4400 | 0162 | 0001 | a290 | 0000 | 0000 | 4400 | 0163 | 0001 | a290 | 0005 | 3654 | 2400 | 0004 | 0001 | a2a0 | 0005 | 3668 | a000 | 0004 |
| 1472460 | 0000 | 0044 | 0000 | 0000 | 4400 | 0169 | 0001 | a2a0 | 0000 | 0000 | 4400 | 0169 | 0001 | a2b0 | 0000 | 0000 | 4400 | 016a | 0001 | a2b0 | 0000 | 0000 | 4400 | 016b |
| 1472540 | 0001 | a2bc | 0005 | 3675 | 2400 | 0004 | 0001 | a2cc | 0005 | 3685 | a000 | 0004 | 0000 | 0044 | 0005 | 3694 | a000 | 0004 | 0000 | 0048 | 0000 | 0000 | 4400 | 0172 |
| 1472620 | 0001 | a2cc | 0000 | 0000 | 4400 | 0172 | 0001 | a2e0 | 0000 | 0000 | 4400 | 0173 | 0001 | a2e0 | 0000 | 0000 | 4400 | 0174 | 0001 | a2fc | 0005 | 36a1 | 2400 | 0004 |
| 1472700 | 0001 | a30c | 0005 | 36b2 | a000 | 0004 | 0000 | 0044 | 0005 | 36c1 | a000 | 0004 | 0000 | 0048 | 0005 | 36dd | a000 | 0004 | 0000 | 004c | 0005 | 36fd | a000 | 0004 |
| 1472760 | 0000 | 0050 | 0000 | 0000 | 4400 | 017d | 0001 | a30c | 0000 | 0000 | 4400 | 017d | 0001 | a328 | 0000 | 0000 | 4400 | 017e | 0001 | a328 | 0000 | 0000 | 4400 | 017f |
| 1473040 | 0001 | a334 | 0000 | 0000 | 4400 | 0180 | 0001 | a348 | 0000 | 0000 | 4400 | 0181 | 0001 | a350 | 0005 | 370a | 2400 | 0004 | 0001 | a360 | 0005 | 371d | a000 | 0001 |
| 1473120 | 0000 | 0044 | 0005 | 3728 | a000 | 0004 | 0000 | 0048 | 0005 | 3735 | a000 | 0001 | 0000 | 004c | 0000 | 0000 | 4400 | 0189 | 0001 | a360 | 0000 | 0000 | 4400 | 0189 |
| 1473200 | 0001 | a378 | 0000 | 0000 | 4400 | 018a | 0001 | a378 | 0000 | 0000 | 4400 | 018b | 0001 | a394 | 0005 | 3740 | 2400 | 0004 | 0001 | a3a4 | 0005 | 3750 | a000 | 0001 |
| 1473260 | 0000 | 0044 | 0005 | 375d | a000 | 0004 | 0000 | 0048 | 0005 | 376a | a000 | 0001 | 0000 | 004c | 0000 | 0000 | 4400 | 0193 | 0001 | a3a4 | 0000 | 0000 | 4400 | 0193 |
| 1473340 | 0001 | a3bc | 0000 | 0000 | 4400 | 0194 | 0001 | a3bc | 0000 | 0000 | 4400 | 0196 | 0001 | a3d8 | 0000 | 0000 | 4400 | 0198 | 0001 | a3f0 | 0000 | 0000 | 4400 | 019c |
| 1473420 | 0001 | a3fc | 0000 | 0000 | 4400 | 019e | 0001 | a404 | 0000 | 0000 | 4400 | 01a0 | 0001 | a410 | 0005 | 3775 | 2400 | 0004 | 0001 | a420 | 0005 | 3788 | a000 | 0004 |
| 1473500 | 0000 | 0044 | 0005 | 3795 | a000 | 0001 | 0000 | 0048 | 0000 | 0000 | 4400 | 01a7 | 0001 | a420 | 0000 | 0000 | 4400 | 01a7 | 0001 | a434 | 0000 | 0000 | 4400 | 01a8 |
| 1473560 | 0001 | a434 | 0000 | 0000 | 4400 | 01aa | 0001 | a450 | 0000 | 0000 | 4400 | 01ab | 0001 | a460 | 0000 | 0000 | 4400 | 01af | 0001 | a46c | 0000 | 0000 | 4400 | 01b1 |
| 1473640 | 0001 | a478 | 0005 | 37a0 | 2400 | 0000 | 0001 | a488 | 0005 | 37b1 | a000 | 0004 | 0000 | 0044 | 0005 | 37be | a000 | 0004 | 0000 | 0048 | 0000 | 0000 | 4400 | 01b8 |
| 1473720 | 0001 | a488 | 0000 | 0000 | 4400 | 01b8 | 0001 | a49c | 0005 | 37ce | 8000 | 0001 | ffff | fffc | 0005 | 37d8 | 8000 | 0001 | ffff | fff8 | 0000 | 0000 | c000 | 0002 |
| 1474000 | 0000 | 0a64 | 0005 | 37e3 | 8000 | 0001 | ffff | fff4 | 0000 | 0000 | 4400 | 01bc | 0001 | a49c | 0000 | 0000 | c000 | 0003 | 0000 | 0a68 | 0000 | 0000 | 4400 | 01bd |
| 1474060 | 0001 | a4c8 | 0000 | 0000 | e000 | 0003 | 0000 | 0aac | 0000 | 0000 | e000 | 0002 | 0000 | 0aac | 0000 | 0000 | 4400 | 01bf | 0001 | a4e4 | 0005 | 37f2 | 2400 | 0000 |
| 1474140 | 0001 | a4ec | 0005 | 3807 | a000 | 0004 | 0000 | 0044 | 0000 | 0000 | 4400 | 01c5 | 0001 | a4ec | 0000 | 0000 | 4400 | 01c5 | 0001 | a4fc | 0000 | 0000 | 4400 | 01c6 |
| 1474220 | 0001 | a4fc | 0000 | 0000 | 4400 | 01c7 | 0001 | a508 | 0005 | 3814 | 0400 | 0000 | 0001 | a510 | 0005 | 381d | 0400 | 0000 | 0001 | c0d0 | 0005 | 3826 | 0400 | 0000 |
| 1474300 | 0001 | ba00 | 0005 | 3832 | 0400 | 0000 | 0001 | bf54 | 0005 | 383c | 0800 | 0000 | 0004 | a3fc | 0005 | 3845 | 0800 | 0000 | 0004 | a4e8 | 0005 | 3851 | 0600 | 0000 |
| 1474360 | 0003 | f3d0 | 0005 | 385b | 0800 | 0000 | 0004 | a4e0 | 0005 | 3865 | 0600 | 0000 | 0003 | f390 | 0005 | 386f | 0400 | 0000 | 0002 | 0a8c | 0005 | 3879 | 0400 | 0000 |
| 1474440 | 0001 | dc10 | 0005 | 3887 | 0800 | 0000 | 0004 | a4dc | 0005 | 388e | 0400 | 0000 | 0001 | add4 | 0005 | 3898 | 0400 | 0000 | 0001 | ba90 | 0005 | 38a6 | 0800 | 0000 |
| 1474520 | 0004 | a4ec | 0005 | 38ad | 0400 | 0000 | 0001 | ce4c | 0005 | 38bd | 0400 | 0000 | 0001 | a5b8 | 0005 | 38ca | 0400 | 0000 | 0001 | b114 | 0005 | 38d7 | 0600 | 0000 |
| 1474600 | 0003 | f344 | 0005 | 38e1 | 0600 | 0000 | 0003 | f24c | 0005 | 38eb | 0600 | 0000 | 0003 | f210 | 0005 | 38f5 | 0400 | 0000 | 0002 | 04e8 | 0005 | 38ff | 0800 | 0000 |
| 1474660 | 0004 | a4d4 | 0005 | 3908 | 0400 | 0000 | 0001 | a510 | 0005 | 3915 | 0400 | 0000 | 0001 | afa0 | 0005 | 3920 | 0800 | 0000 | 0004 | a3f8 | 0005 | 392a | 0400 | 0000 |
| 1474740 | 0001 | b580 | 0005 | 3937 | 0400 | 0000 | 0001 | aabc | 0005 | 3944 | 0600 | 0000 | 0003 | f3d4 | 0005 | 394f | 0800 | 0000 | 0004 | a4cc | 0005 | 395a | 0600 | 0000 |
| 1475020 | 0003 | f3dc | 0005 | 3965 | 0400 | 0000 | 0001 | bd70 | 0005 | 396f | 0400 | 0000 | 0001 | aba4 | 0005 | 397c | 0400 | 0000 | 0001 | d2b0 | 0005 | 3989 | 0400 | 0000 |
| 1475100 | 0002 | 0908 | 0005 | 3994 | 0400 | 0000 | 0001 | bbf0 | 0005 | 399f | 0400 | 0000 | 0001 | b468 | 0005 | 39ae | 0400 | 0000 | 0001 | b048 | 0005 | 39bd | 0800 | 0000 |
| 1475160 | 0004 | a4d8 | 0005 | 39cc | 0600 | 0000 | 0003 | f3a8 | 0005 | 39d6 | 0600 | 0000 | 0003 | f3ac | 0005 | 39e4 | 0600 | 0000 | 0003 | f2cc | 0005 | 39eb | 0600 | 0000 |
| 1475240 | 0003 | f3d8 | 0005 | 39f6 | 0400 | 0000 | 0002 | 0c14 | 0005 | 3a01 | 0800 | 0000 | 0004 | a4d0 | 0005 | 3a09 | 0800 | 0000 | 0004 | a4c8 | 0005 | 3a14 | 0600 | 0000 |
| 1475320 | 0003 | f308 | 0005 | 3a1f | 0600 | 0000 | 0003 | f28c | 0005 | 3a2a | 0800 | 0000 | 0004 | a400 | 0005 | 3a35 | 0400 | 0000 | 0001 | ec48 | 0005 | 3a40 | 0400 | 0000 |
| 1475400 | 0002 | 026c | 0005 | 3a4b | 0400 | 0000 | 0001 | e934 | 0005 | 3a56 | 0400 | 0000 | 0001 | ce2c | 0005 | 3a61 | 0600 | 0000 | 0003 | f3cc | 0005 | 3a6d | 0400 | 0000 |
| 1475460 | 0001 | a7fc | 0005 | 3a7b | 0600 | 0000 | 0003 | f3c8 | 0005 | 3a8a | 0600 | 0000 | 0003 | f3c0 | 0005 | 3a93 | 0400 | 0000 | 0001 | e518 | 0005 | 3a9b | 0400 | 0000 |
| 1475540 | 0001 | daf4 | 0005 | 3aa4 | 0800 | 0000 | 0004 | a4e4 | 0005 | 3aad | 0600 | 0000 | 0003 | f3bc | 0005 | 3ab8 | 0400 | 0000 | 0002 | 039c | 0005 | 3ac1 | 0400 | 0000 |
| 1475620 | 0001 | c944 | 0005 | 3ad0 | 0400 | 0000 | 0001 | db58 | 0005 | 3ad9 | 0400 | 0000 | 0001 | b860 | 0005 | 3ae6 | 0400 | 0000 | 0001 | e358 | 0005 | 3af3 | 0400 | 0000 |
| 1475700 | 0001 | a6c4 | 0005 | 3b00 | 6400 | 0000 | 0001 | a510 | 0005 | 3b27 | 6400 | 0000 | 0001 | a510 | 0005 | 3b30 | 8000 | 0000 | 0000 | 0000 | 0005 | 3b5a | 8000 | 0000 |
| 1475760 | 0000 | 0000 | 0005 | 3b74 | 8000 | 0000 | 0000 | 0000 | 0005 | 3b9f | 8000 | 0000 | 0000 | 0000 | 0005 | 3bc1 | 8000 | 0000 | 0000 | 0000 | 0005 | 3be4 | 8000 | 0000 |

```
1476040 0000 0000 0005 3c0a 8000 0000 0000 0000 0005 3c2c 8000 0000 0000 0000 0005 3c4d 8000 0000 0000 0000 0005 3c66 8000 0000
1476120 0000 0000 0005 3c81 8000 0000 0000 0000 0005 3c95 8000 0000 0000 0000 0005 3ca7 2600 0001 0003 f210 0005 3ccb c200 0000
1476200 0000 0ff2 0005 3ce0 8200 0000 0000 1cf1 0005 3ceb 8400 0000 0001 a510 0005 3cf6 2600 0001 0003 f24c 0005 3d19 8000 0010
1476260 ffff fb05 0005 3d89 8000 0010 ffff fb05 0000 0000 a200 0000 0000 0000 0005 3d99 8200 0000 0000 1b24 0005 3da5 8400 0000
1476340 0001 a510 0005 3db1 2600 0001 0003 f28c 0005 3dd5 8200 0000 0000 2882 0005 3df7 8400 0000 0001 a510 0005 3e19 2600 0001
1476420 0003 f2cc 0005 3e39 8000 0001 ffff fb05 0005 3ebb 8000 0004 ffff fb05 0005 3eca 8000 0004 ffff fb05 0005 3efa 8000 0004
1476500 ffff fb05 0000 0000 a200 0000 0000 0000 0005 3f1a 2000 0004 0000 0000 0005 3f2f 2000 0004 0000 0000 0005 3f3f 2000 0004
1476560 0000 0000 0000 0000 a200 0000 0000 0000 0005 3f5e 8200 0000 0000 0bf9 0005 3f6a 8400 0000 0001 a510 0005 3f76 2600 0001
1476640 0003 f308 0005 3f87 c200 0000 0000 0000 0005 3f93 c200 0000 0000 07e7 0005 3fb5 8000 0004 ffff fb05 0000 0000 a200 0000
1476720 0000 0000 0005 3fc7 8200 0000 0000 4830 0005 3fd2 8400 0000 0001 a510 0005 3fdd 2600 0001 0003 f344 0005 3fed 8000 0004
1477000 ffff fb05 0005 4015 8000 0004 ffff fb05 0005 4024 8000 0004 ffff fb05 0005 404c 8000 0004 ffff fb05 0005 405a 8000 0008
1477060 ffff fb05 0005 4091 8000 0008 ffff fb05 0005 409f 8000 0014 ffff fb05 0005 4143 8000 0014 ffff fb05 0005 4153 2000 0004
1477140 0000 0000 0005 4162 2000 0004 0000 0000 0005 4173 2000 0004 0000 0000 0005 4183 2000 0004 0000 0000 0000 0000 a200 0000
1477220 0000 0000 0005 4194 8000 0030 ffff fb05 0005 425c 8000 0030 ffff fb05 0005 4288 8000 0034 ffff fb05 0005 4332 8000 0034
1477300 ffff fb05 0005 4399 8000 0214 ffff fb05 0005 449c 8000 0030 ffff fb05 0005 4544 8000 0030 ffff fb05 0005 45af 8000 000c
1477360 ffff fb05 0005 461c 8000 000c ffff fb05 0005 462c 8000 007c ffff fb05 0005 46f1 8000 007c ffff fb05 0005 47a6 8000 007c
1477440 ffff fb05 0005 483a 8000 007c ffff fb05 0005 4846 2000 0001 0000 0000 0005 4855 8400 0000 0001 a510 0005 485e 2600 0001
1477520 0003 f390 0005 4882 2600 0001 0003 f3a8 0005 48a5 2600 0001 0003 f3ac 0005 48cd 2600 0004 0003 f3bc 0005 48de 2600 0001
1477600 0003 f3c0 0005 4900 2600 007c 0003 f3c8 0005 4916 2600 0214 0003 f3cc 0005 4929 2600 0014 0003 f3d0 0005 493a 2600 0001
1477660 0003 f3d4 0005 494b 2800 0001 0004 a3f8 0005 495b 2800 007c 0004 a3fc 0005 496b 2600 0001 0003 f3d8 0005 497c 2600 0001
1477740 0003 f3dc 0005 498d 2800 0004 0004 a400 0005 49b2 2800 0004 0004 a4c8 0005 49c3 2800 0004 0004 a4cc 0005 49d4 2800 0004
1500020 0004 a4d0 0005 49e2 2800 0004 0004 a4d4 0005 49f1 2800 0004 0004 a4d8 0005 4a06 2800 0004 0004 a4dc 0005 4a13 2800 0004
1500100 0004 a4e0 0005 4a23 2800 0004 0004 a4e4 0005 4a32 2800 0004 0004 a4e8 0005 4a44 2800 0004 0004 a4ec 0005 4a51 2000 0014
1500160 0000 0000 0005 4a65 2000 0014 0000 0000 0005 4a77 2400 0004 0001 a510 0005 4a8a a000 007c 0000 0044 0005 4a95 a000 0004
1500240 0000 0048 0000 0000 4400 012d 0001 a510 0000 0000 4400 012d 0001 a524 0005 4aa3 8000 0014 ffff fffc 0000 0000 c000 0002
1500320 0000 0014 0000 0000 4400 0130 0001 a524 0000 0000 4400 0131 0001 a560 0000 0000 4400 0132 0001 a56c 0000 0000 4400 0133
1500400 0001 a590 0000 0000 e000 0002 0000 0098 0000 0000 4400 0134 0001 a5a8 0005 4aad 2400 0004 0001 a5b8 0005 4ac0 a000 007c
1500460 0000 0044 0005 4acb a000 0001 0000 0048 0000 0000 4400 013e 0001 a5b8 0000 0000 4400 013e 0001 a5cc 0005 4ad6 4000 0014
1500540 0000 001d 0005 4ae1 4000 0004 0000 001c 0005 4aea 4000 0001 0000 001b 0005 4af5 8000 0004 ffff fffc 0000 0000 c000 0002
1500620 0000 00bc 0000 0000 4400 0144 0001 a5cc 0000 0000 4400 0145 0001 a5d8 0000 0000 4400 0146 0001 a5dc 0000 0000 4400 0147
1500700 0001 a5e0 0000 0000 4400 0148 0001 a5e0 0000 0000 4400 0149 0001 a630 0000 0000 4400 014a 0001 a640 0000 0000 4400 014b
1500760 0001 a68c 0000 0000 4400 014c 0001 a69c 0000 0000 4400 014d 0001 a6ac 0000 0000 e000 0002 0000 01a4 0000 0000 4400 014e
1501040 0001 a6b4 0005 4afd 2400 0004 0001 a6c4 0005 4b10 a000 0014 0000 0044 0005 4b1b a000 0004 0000 0048 0000 0000 4400 0158
1501120 0001 a6c4 0000 0000 4400 0158 0001 a6d8 0000 0000 4400 0159 0001 a6d8 0000 0000 4400 015a 0001 a6e8 0000 0000 4400 0159
1501200 0001 a7d8 0000 0000 4400 015b 0001 a7ec 0005 4b24 2400 0004 0001 a7fc 0005 4b38 a000 007c 0000 0044 0005 4b43 a000 0004
1501260 0000 0048 0005 4b51 a000 0001 0000 004c 0000 0000 4400 0166 0001 a7fc 0000 0000 4400 0166 0001 a814 0005 4b5c 4000 0014
1501340 0000 001d 0005 4b67 4000 0004 0000 001c 0005 4b70 4000 0001 0000 001b 0000 0000 c000 0002 0000 0304 0000 0000 4400 016b
1501420 0001 a814 0000 0000 4400 016c 0001 a824 0000 0000 4400 016d 0001 a830 0000 0000 4400 016f 0001 a848 0000 0000 4400 0174
1501500 0001 a858 0000 0000 4400 0176 0001 a870 0000 0000 4400 0178 0001 a880 0000 0000 4400 0179 0001 a884 0000 0000 4400 017a
1501560 0001 a888 0000 0000 4400 017b 0001 a898 0000 0000 4400 017c 0001 a97c 0000 0000 4400 017d 0001 a98c 0000 0000 4400 017e
1501640 0001 aa88 0000 0000 4400 017f 0001 aa98 0000 0000 4400 0180 0001 aaa4 0000 0000 e000 0002 0000 059c 0000 0000 4400 0181
1501720 0001 aaac 0005 4b7b 2400 0004 0001 aabc 0005 4b8e a000 0030 0000 0044 0005 4b9b a000 0001 0000 0048 0005 4ba5 a000 0004
1502000 0000 004c 0000 0000 4400 018c 0001 aabc 0005 4bb5 4000 0001 0000 0019 0000 0000 4400 018c 0001 aad0 0005 4bbf 4000 0004
1502060 0000 001d 0005 4bc8 4000 0004 0000 001c 0000 0000 c000 0002 0000 05c0 0000 0000 4400 018f 0001 aad0 0000 0000 4400 0190
1502140 0001 aae8 0000 0000 4400 0191 0001 aaf0 0000 0000 4400 0192 0001 ab28 0000 0000 4400 0193 0001 ab38 0000 0000 4400 0194
1502220 0001 ab40 0000 0000 4400 0195 0001 ab68 0000 0000 4400 0194 0001 ab88 0000 0000 e000 0002 0000 0694 0000 0000 4400 0196
1502300 0001 ab94 0005 4bd5 2400 0004 0001 aba4 0005 4be8 a000 0001 0000 0044 0005 4bf4 a000 0004 0000 0048 0005 4bff a000 0014
1502360 0000 004c 0000 0000 4400 01a2 0001 aba4 0005 4c0a 4000 0001 0000 0018 0005 4c16 4000 0004 0000 0019 0005 4c21 4000 0014
1502440 0000 001a 0000 0000 4400 01a2 0001 abb0 0000 0000 4400 01a3 0001 abb0 0000 0000 4400 01a4 0001 abb4 0000 0000 4400 01a5
1502520 0001 abb4 0000 0000 4400 01a6 0001 aca8 0000 0000 4400 01a7 0001 acb8 0000 0000 4400 01a8 0001 adb4 0000 0000 4400 01a9
1502600 0001 adc4 0005 4c2c 2400 0004 0001 add4 0005 4c3c a000 0001 0000 0044 0000 0000 4400 01b2 0001 add4 0000 0000 4400 01b2
1502660 0001 ade4 0005 4c45 8000 0004 ffff fffc 0005 4c4f 8000 0001 ffff ffec 0000 0000 c000 0002 0000 08d4 0000 0000 4400 01b6
1502740 0001 ade4 0000 0000 4400 01b7 0001 ae2c 0000 0000 4400 01b8 0001 ae38 0000 0000 4400 01b9 0001 ae40 0000 0000 4400 01ba
1503020 0001 ae60 0000 0000 4400 01bb 0001 ae6c 0000 0000 4400 01bc 0001 ae78 0000 0000 4400 01bd 0001 ae80 0000 0000 4400 01be
1503100 0001 ae94 0000 0000 4400 01bf 0001 aea0 0000 0000 4400 01c0 0001 aeb8 0000 0000 4400 01c1 0001 aed0 0000 0000 4400 01c2
```

| | | | | | | | | | | | | | | | | | | | | | | | | |
|---|---|---|---|---|---|---|---|---|---|---|---|---|---|---|---|---|---|---|---|---|---|---|---|---|
| 1503160 | 0001 | aee0 | 0000 | 0000 | 4400 | 01c4 | 0001 | aeec | 0000 | 0000 | 4400 | 01c5 | 0001 | af04 | 0000 | 0000 | 4400 | 01c6 | 0001 | af10 | 0000 | 0000 | 4400 | 01c7 |
| 1503240 | 0001 | af24 | 0000 | 0000 | 4400 | 01c8 | 0001 | af30 | 0000 | 0000 | 4400 | 01c9 | 0001 | af44 | 0000 | 0000 | 4400 | 01ca | 0001 | af58 | 0000 | 0000 | 4400 | 01cb |
| 1503320 | 0001 | af78 | 0000 | 0000 | 4400 | 01cc | 0001 | af84 | 0000 | 0000 | e000 | 0002 | 0000 | 0a80 | 0000 | 0000 | 4400 | 01cd | 0001 | af90 | 0005 | 4c5b | 2400 | 0004 |
| 1503400 | 0001 | afa0 | 0005 | 4c6c | a000 | 0001 | 0000 | 0044 | 0000 | 0000 | 4400 | 01d6 | 0001 | afa0 | 0000 | 0000 | 4400 | 01d6 | 0001 | afbc | 0000 | 0000 | 4400 | 01d7 |
| 1503460 | 0001 | afb0 | 0000 | 0000 | 4400 | 01d8 | 0001 | afc4 | 0000 | 0000 | 4400 | 01d9 | 0001 | afe4 | 0000 | 0000 | 4400 | 01da | 0001 | b004 | 0000 | 0000 | 4400 | 01db |
| 1503540 | 0001 | b010 | 0000 | 0000 | 4400 | 01dc | 0001 | b024 | 0000 | 0000 | 4400 | 01dd | 0001 | b038 | 0005 | 4c78 | 2400 | 0004 | 0001 | b048 | 0005 | 4c8d | a000 | 0034 |
| 1503620 | 0000 | 0044 | 0000 | 0000 | 4400 | 01e6 | 0001 | b048 | 0000 | 0000 | 4400 | 01e6 | 0001 | b058 | 0005 | 4ca2 | 8000 | 0030 | ffff | fffc | 0000 | 0000 | c000 | 0002 |
| 1503700 | 0000 | 0b48 | 0000 | 0000 | 4400 | 01e9 | 0001 | b058 | 0000 | 0000 | 4400 | 01ea | 0001 | b060 | 0000 | 0000 | 4400 | 01eb | 0001 | b070 | 0000 | 0000 | 4400 | 01ec |
| 1503760 | 0001 | b080 | 0000 | 0000 | 4400 | 01ed | 0001 | b094 | 0000 | 0000 | 4400 | 01ee | 0001 | b0a8 | 0000 | 0000 | 4400 | 01ef | 0001 | b0b8 | 0000 | 0000 | 4400 | 01f0 |
| 1504040 | 0001 | b0c8 | 0000 | 0000 | 4400 | 01f1 | 0001 | b0d8 | 0000 | 0000 | 4400 | 01f2 | 0001 | b0e8 | 0000 | 0000 | 4400 | 01f3 | 0001 | b0f8 | 0000 | 0000 | e000 | 0002 |
| 1504120 | 0000 | 0bf4 | 0000 | 0000 | 4400 | 01f4 | 0001 | b104 | 0005 | 4cb5 | 2400 | 0004 | 0001 | b114 | 0005 | 4cc8 | a000 | 007c | 0000 | 0044 | 0000 | 0000 | 4400 | 01fd |
| 1504200 | 0001 | b114 | 0000 | 0000 | 4400 | 01fd | 0001 | b124 | 0005 | 4cd3 | 8000 | 0014 | ffff | fffc | 0005 | 4cdd | 8000 | 0034 | ffff | fff8 | 0005 | 4ce9 | 8000 | 0001 |
| 1504260 | ffff | fff4 | 0005 | 4cf5 | 8000 | 0004 | ffff | fff0 | 0005 | 4cfd | 8000 | 0004 | ffff | ffec | 0000 | 0000 | c000 | 0002 | 0000 | 0c14 | 0000 | 0000 | 4400 | 0205 |
| 1504340 | 0001 | b124 | 0000 | 0000 | 4400 | 0206 | 0001 | b130 | 0000 | 0000 | 4400 | 0207 | 0001 | b140 | 0000 | 0000 | 4400 | 0208 | 0001 | b14c | 0000 | 0000 | 4400 | 0209 |
| 1504420 | 0001 | b154 | 0000 | 0000 | 4400 | 020a | 0001 | b1a8 | 0000 | 0000 | 4400 | 020b | 0001 | b1b8 | 0000 | 0000 | 4400 | 020c | 0001 | b1c4 | 0000 | 0000 | 4400 | 020d |
| 1504500 | 0001 | b1dc | 0000 | 0000 | 4400 | 020e | 0001 | b1f4 | 0000 | 0000 | 4400 | 020f | 0001 | b248 | 0000 | 0000 | 4400 | 0210 | 0001 | b258 | 0000 | 0000 | 4400 | 0211 |
| 1504560 | 0001 | b264 | 0000 | 0000 | 4400 | 020d | 0001 | b27c | 0000 | 0000 | 4400 | 0214 | 0001 | b290 | 0000 | 0000 | 4400 | 0215 | 0001 | b2b0 | 0000 | 0000 | 4400 | 0219 |
| 1504640 | 0001 | b2bc | 0000 | 0000 | 4400 | 021a | 0001 | b2d4 | 0000 | 0000 | 4400 | 021d | 0001 | b2e0 | 0000 | 0000 | 4400 | 021e | 0001 | b320 | 0000 | 0000 | 4400 | 021f |
| 1504720 | 0001 | b32c | 0000 | 0000 | 4400 | 0220 | 0001 | b340 | 0000 | 0000 | 4400 | 0221 | 0001 | b34c | 0000 | 0000 | 4400 | 0222 | 0001 | b360 | 0000 | 0000 | 4400 | 0223 |
| 1505000 | 0001 | b36c | 0000 | 0000 | 4400 | 0224 | 0001 | b388 | 0000 | 0000 | 4400 | 0225 | 0001 | b394 | 0000 | 0000 | 4400 | 0226 | 0001 | b3a8 | 0000 | 0000 | 4400 | 0227 |
| 1505060 | 0001 | b3b4 | 0000 | 0000 | 4400 | 0228 | 0001 | b3e4 | 0000 | 0000 | 4400 | 0229 | 0001 | b3f0 | 0000 | 0000 | 4400 | 022a | 0001 | b410 | 0000 | 0000 | 4400 | 022b |
| 1505140 | 0001 | b41c | 0000 | 0000 | 4400 | 022c | 0001 | b440 | 0000 | 0000 | 4400 | 022e | 0001 | b44c | 0000 | 0000 | e000 | 0002 | 0000 | 0f48 | 0000 | 0000 | 4400 | 022f |
| 1505220 | 0001 | b458 | 0005 | 4d05 | 2400 | 0004 | 0001 | b468 | 0005 | 4d1a | a000 | 007c | 0000 | 0044 | 0000 | 0000 | 4400 | 0238 | 0001 | b468 | 0000 | 0000 | 4400 | 0238 |
| 1505300 | 0001 | b478 | 0005 | 4d25 | 8000 | 0034 | ffff | fffc | 0000 | 0000 | c000 | 0002 | 0000 | 0f68 | 0000 | 0000 | 4400 | 023b | 0001 | b478 | 0000 | 0000 | 4400 | 023c |
| 1505360 | 0001 | b488 | 0000 | 0000 | 4400 | 023d | 0001 | b494 | 0000 | 0000 | 4400 | 023e | 0001 | b4a0 | 0000 | 0000 | 4400 | 023f | 0001 | b4ac | 0000 | 0000 | 4400 | 0240 |
| 1505440 | 0001 | b4b4 | 0000 | 0000 | 4400 | 0241 | 0001 | b4c0 | 0000 | 0000 | 4400 | 0242 | 0001 | b4c8 | 0000 | 0000 | 4400 | 0243 | 0001 | b4d4 | 0000 | 0000 | 4400 | 0244 |
| 1505520 | 0001 | b4e0 | 0000 | 0000 | 4400 | 0245 | 0001 | b4ec | 0000 | 0000 | 4400 | 0246 | 0001 | b4f8 | 0000 | 0000 | 4400 | 0247 | 0001 | b50c | 0000 | 0000 | 4400 | 0248 |
| 1505600 | 0001 | b520 | 0000 | 0000 | 4400 | 0249 | 0001 | b530 | 0000 | 0000 | 4400 | 024a | 0001 | b548 | 0000 | 0000 | 4400 | 024b | 0001 | b55c | 0000 | 0000 | 4400 | 024c |
| 1505660 | 0001 | b568 | 0000 | 0000 | e000 | 0002 | 0000 | 1060 | 0000 | 0000 | 4400 | 024d | 0001 | b570 | 0005 | 4d31 | 2400 | 0004 | 0001 | b580 | 0005 | 4d44 | a000 | 007c |
| 1505740 | 0000 | 0044 | 0000 | 0000 | 4400 | 0259 | 0001 | b580 | 0000 | 0000 | 4400 | 0259 | 0001 | b590 | 0005 | 4d4f | 8000 | 0001 | ffff | ffff | 0005 | 4d5e | 8000 | 0004 |
| 1506020 | ffff | fff8 | 0005 | 4d6d | 8000 | 0004 | ffff | fff4 | 0005 | 4d75 | 8000 | 0004 | ffff | fff0 | 0005 | 4d84 | 8000 | 0004 | ffff | ffec | 0000 | 0000 | c000 | 0002 |
| 1506100 | 0000 | 1080 | 0000 | 0000 | 4400 | 0261 | 0001 | b590 | 0000 | 0000 | 4400 | 0263 | 0001 | b5b4 | 0000 | 0000 | 4400 | 0265 | 0001 | b5d4 | 0000 | 0000 | 4400 | 0266 |
| 1506160 | 0001 | b624 | 0000 | 0000 | 4400 | 0267 | 0001 | b638 | 0000 | 0000 | 4400 | 0268 | 0001 | b674 | 0000 | 0000 | 4400 | 026c | 0001 | b688 | 0000 | 0000 | 4400 | 026d |
| 1506240 | 0001 | b6a0 | 0000 | 0000 | 4400 | 0271 | 0001 | b6ac | 0000 | 0000 | 4400 | 0272 | 0001 | b6c0 | 0000 | 0000 | 4400 | 0274 | 0001 | b6f8 | 0000 | 0000 | 4400 | 0276 |
| 1506320 | 0001 | b70c | 0000 | 0000 | 4400 | 0278 | 0001 | b71c | 0000 | 0000 | 4400 | 027a | 0001 | b74c | 0000 | 0000 | 4400 | 027b | 0001 | b764 | 0000 | 0000 | 4400 | 027c |
| 1506400 | 0001 | b770 | 0000 | 0000 | 4400 | 027d | 0001 | b788 | 0000 | 0000 | 4400 | 027e | 0001 | b798 | 0000 | 0000 | 4400 | 027f | 0001 | b7d4 | 0000 | 0000 | 4400 | 0280 |
| 1506460 | 0001 | b7e4 | 0000 | 0000 | 4400 | 0281 | 0001 | b7f8 | 0000 | 0000 | 4400 | 0282 | 0001 | b80c | 0000 | 0000 | 4400 | 0283 | 0001 | b830 | 0000 | 0000 | 4400 | 0284 |
| 1506540 | 0001 | b844 | 0000 | 0000 | e000 | 0002 | 0000 | 1340 | 0000 | 0000 | 4400 | 0285 | 0001 | b850 | 0005 | 4d93 | 2400 | 0004 | 0001 | b860 | 0005 | 4da6 | a000 | 007c |
| 1506620 | 0000 | 0044 | 0005 | 4db1 | a000 | 0004 | 0000 | 0048 | 0000 | 0000 | 4400 | 028f | 0001 | b860 | 0000 | 0000 | 4400 | 028f | 0001 | b874 | 0005 | 4dc1 | 8000 | 0004 |
| 1506700 | ffff | fffc | 0005 | 4dd0 | 8000 | 0004 | ffff | fff8 | 0000 | 0000 | c000 | 0002 | 0000 | 1364 | 0000 | 0000 | 4400 | 0293 | 0001 | b874 | 0000 | 0000 | 4400 | 0294 |
| 1506760 | 0001 | b8b0 | 0000 | 0000 | 4400 | 0295 | 0001 | b8bc | 0000 | 0000 | 4400 | 0296 | 0001 | b8d9 | 0000 | 0000 | 4400 | 0297 | 0001 | b8f8 | 0000 | 0000 | 4400 | 0298 |
| 1507040 | 0001 | b90c | 0000 | 0000 | 4400 | 0299 | 0001 | b93c | 0000 | 0000 | 4400 | 029d | 0001 | b97c | 0000 | 0000 | 4400 | 029f | 0001 | b994 | 0000 | 0000 | 4400 | 02a0 |
| 1507120 | 0001 | b9e4 | 0000 | 0000 | e000 | 0002 | 0000 | 14e0 | 0000 | 0000 | 4400 | 02a2 | 0001 | b9f0 | 0005 | 4dd8 | 2400 | 0004 | 0001 | ba00 | 0005 | 4dea | a000 | 0001 |
| 1507200 | 0000 | 0044 | 0000 | 0000 | 4400 | 02ab | 0001 | ba00 | 0000 | 0000 | 4400 | 02ab | 0001 | ba10 | 0005 | 4df9 | 8000 | 0004 | ffff | fffc | 0000 | 0000 | c000 | 0002 |
| 1507260 | 0000 | 1570 | 0000 | 0000 | 4400 | 02ae | 0001 | ba10 | 0000 | 0000 | 4400 | 02af | 0001 | ba14 | 0000 | 0000 | 4400 | 02b0 | 0001 | ba40 | 0000 | 0000 | 4400 | 02b1 |
| 1507340 | 0001 | ba4c | 0000 | 0000 | 4400 | 02b2 | 0001 | ba5c | 0000 | 0000 | 4400 | 02b4 | 0001 | ba74 | 0000 | 0000 | e000 | 0002 | 0000 | 1570 | 0000 | 0000 | 4400 | 02b5 |
| 1507420 | 0001 | ba80 | 0005 | 4e01 | 2400 | 0004 | 0001 | ba90 | 0005 | 4e15 | a000 | 007c | 0000 | 0044 | 0000 | 0000 | 4400 | 02be | 0001 | ba90 | 0000 | 0000 | 4400 | 02be |
| 1507500 | 0001 | baa0 | 0005 | 4e20 | 8000 | 0001 | ffff | fffc | 0005 | 4e2c | 8000 | 0001 | ffff | fff8 | 0005 | 4e38 | 8000 | 0004 | ffff | fff4 | 0005 | 4e44 | 8000 | 0004 |
| 1507560 | ffff | fff0 | 0000 | 0000 | c000 | 0002 | 0000 | 1590 | 0000 | 0000 | 4400 | 02c2 | 0001 | baa0 | 0000 | 0000 | 4400 | 02c3 | 0001 | bad8 | 0000 | 0000 | 4400 | 02c4 |
| 1507640 | 0001 | bae4 | 0000 | 0000 | 4400 | 02c5 | 0001 | bb10 | 0000 | 0000 | 4400 | 02c6 | 0001 | bb28 | 0000 | 0000 | 4400 | 02c7 | 0001 | bb34 | 0000 | 0000 | 4400 | 02c8 |
| 1507720 | 0001 | bb40 | 0000 | 0000 | 4400 | 02c9 | 0001 | bb4c | 0000 | 0000 | 4400 | 02ca | 0001 | bb5c | 0000 | 0000 | 4400 | 02cb | 0001 | bb6c | 0000 | 0000 | 4400 | 02ca |
| 1510000 | 0001 | bb94 | 0000 | 0000 | 4400 | 02cc | 0001 | bba8 | 0000 | 0000 | 4400 | 02cd | 0001 | bbb8 | 0000 | 0000 | 4400 | 02cc | 0001 | bbcc | 0000 | 0000 | e000 | 0002 |
| 1510060 | 0000 | 16d0 | 0000 | 0000 | 4400 | 02ce | 0001 | bbe0 | 0005 | 4e50 | 2400 | 0001 | 0001 | bbf0 | 0005 | 4e61 | a000 | 0001 | 0000 | 0044 | 0000 | 0000 | 4400 | 02db |
| 1510140 | 0001 | bbf0 | 0000 | 0000 | 4400 | 02db | 0001 | bc00 | 0000 | 0000 | 4400 | 02dd | 0001 | bc00 | 0000 | 0000 | 4400 | 02de | 0001 | bc40 | 0000 | 0000 | 4400 | 02df |
| 1510220 | 0001 | bca0 | 0000 | 0000 | 4400 | 02e0 | 0001 | bce0 | 0000 | 0000 | 4400 | 02e1 | 0001 | bd40 | 0000 | 0000 | 4400 | 02e2 | 0001 | bd54 | 0000 | 0000 | 4400 | 02e3 |

```
1510300 0001 bd60 0005 4e6d 2800 0014 0001 bd70 0005 4e7e a000 0001 0000 0044 0005 4e93 a000 0001 0000 0048 0000 0000 4400 02ec
1510360 0001 bd70 0000 0000 4400 02ec 0001 bd84 0005 4e9f 8000 0001 ffff fffc 0005 4eaa 8000 0014 ffff fff8 0005 4eb4 8000 0001
1510440 ffff fff7 0000 0000 c000 0002 0000 1874 0000 0000 4400 02f1 0001 bd84 0000 0000 4400 02f2 0001 bd90 0000 0000 4400 02f3
1510520 0001 bd9c 0000 0000 4400 02f4 0001 bda8 0000 0000 4400 02f5 0001 bdbc 0000 0000 4400 02f6 0001 bdc8 0000 0000 4400 02f7
1510600 0001 bde0 0000 0000 4400 02f8 0001 bdf8 0000 0000 4400 02f9 0001 be0c 0000 0000 4400 02fb 0001 be4c 0000 0000 4400 02fc
1510660 0001 be60 0000 0000 4400 02fe 0001 be98 0000 0000 4400 0300 0001 beb0 0000 0000 4400 0301 0001 bef8 0000 0000 4400 0309
1510740 0001 bf19 0000 0000 4400 030a 0001 bf24 0000 0000 4400 030b 0001 bf30 0000 0000 4400 030c 0001 bf38 0000 0000 e000 0002
1511020 0000 1a34 0000 0000 4400 030d 0001 bf44 0005 4ec3 2400 007c 0001 bf54 0005 4ed4 a000 0014 0000 0044 0005 4edf a000 0001
1511100 0000 0048 0005 4eeb a000 0001 0000 004c 0000 0000 4400 0318 0001 bf54 0000 0000 4400 0318 0001 bf6c 0005 4efb 8000 007c
1511160 ffff fffc 0005 4f05 8000 0004 ffff fff8 0000 0000 c000 0002 0000 1a5c 0000 0000 4400 031c 0001 bf6c 0000 0000 4400 031d
1511240 0001 bf7c 0000 0000 4400 031e 0001 bf90 0000 0000 4400 031f 0001 bf9c 0000 0000 4400 0320 0001 bfa8 0000 0000 4400 0321
1511320 0001 bfcc 0000 0000 4400 0322 0001 bfe0 0000 0000 4400 0323 0001 c00c 0000 0000 4400 0324 0001 c038 0000 0000 4400 0325
1511400 0001 c044 0000 0000 4400 0326 0001 c04c 0000 0000 4400 0327 0001 c058 0000 0000 4400 0328 0001 c060 0000 0000 4400 0329
1511460 0001 c068 0000 0000 4400 032a 0001 c070 0000 0000 4400 032b 0001 c078 0000 0000 4400 032c 0001 c080 0000 0000 4400 032d
1511540 0001 c088 0000 0000 4400 032e 0001 c09c 0000 0000 4400 032f 0001 c0b4 0000 0000 e000 0002 0000 1bb0 0000 0000 4400 0330
1511620 0001 c0c0 0005 4f11 2400 0001 0001 c0dc 0005 4f20 a000 007c 0000 0044 0005 4f2b a000 0004 0000 0048 0005 4f39 a000 0004
1511700 0000 004c 0005 4f45 a000 0004 0000 0050 0000 0000 4400 033f 0001 c0d0 0000 0000 4400 033f 0001 c0ec 0005 4f59 8000 0004
1511760 ffff fffc 0005 4f64 8000 0004 ffff fff8 0005 4f74 8000 0004 ffff fff4 0005 4f81 8000 0004 ffff fff0 0005 4f92 8000 0001
1512040 ffff ffec 0005 4f9e 8000 0001 ffff ffe8 0000 0000 c000 0002 0000 1bdc 0000 0000 4400 0343 0001 c0ec 0000 0000 4400 0344
1512120 0001 c104 0000 0000 4400 0345 0001 c124 0000 0000 4400 0346 0001 c13c 0000 0000 4400 0347 0001 c144 0000 0000 4400 0348
1512200 0001 c150 0000 0000 4400 0349 0001 c160 0000 0000 4400 034a 0001 c16c 0000 0000 4400 034b 0001 c17c 0000 0000 4400 034c
1512260 0001 c18c 0000 0000 4400 034d 0001 c1a0 0000 0000 4400 034e 0001 c1b0 0000 0000 4400 034f 0001 c1c0 0000 0000 4400 0350
1512340 0001 c1d8 0000 0000 4400 0351 0001 c1e4 0000 0000 4400 0352 0001 c1f0 0000 0000 4400 0353 0001 c1fc 0000 0000 4400 0348
1512420 0001 c208 0000 0000 4400 0355 0001 c21c 0000 0000 4400 0356 0001 c22c 0000 0000 4400 0357 0001 c23c 0000 0000 e000 0002
1512500 0000 1d3c 0000 0000 4400 0358 0001 c24c 0005 4fab 2400 0004 0001 c25c 0005 4fb8 a000 0001 0000 0044 0005 4fc4 a000 0001
1512560 0000 0048 0000 0000 4400 0361 0001 c25c 0000 0000 4400 0361 0001 c270 0005 4fd0 8000 007c ffff fffc 0005 4fda 8000 0004
1512640 ffff fff8 0005 4fe2 8000 0004 ffff fff4 0005 4ff3 8000 0004 ffff fff0 0005 5003 8000 0004 ffff ffec 0005 5012 8000 0004
1512720 ffff ffe8 0005 5020 8000 0002 ffff ffe6 0005 502d 8000 0002 ffff ffe4 0005 503b 8000 0001 ffff ffe0 0005 504a 8000 0001
1513000 ffff ffdc 0005 5058 8000 0014 ffff ffd8 0000 0000 c000 0002 0000 1d60 0000 0000 4400 036a 0001 c270 0000 0000 4400 036b
1513060 0001 c2b0 0000 0000 4400 036c 0001 c2c0 0000 0000 4400 036d 0001 c2d4 0000 0000 4400 036e 0001 c2dc 0000 0000 4400 036f
1513140 0001 c2e4 0000 0000 4400 0370 0001 c2f0 0000 0000 4400 0371 0001 c2f4 0000 0000 4400 0375 0001 c320 0000 0000 4400 0376
1513220 0001 c330 0000 0000 4400 0378 0001 c348 0000 0000 4400 037a 0001 c358 0000 0000 4400 037b 0001 c360 0000 0000 4400 037c
1513300 0001 c374 0000 0000 4400 037d 0001 c384 0000 0000 4400 037e 0001 c3bc 0000 0000 4400 0380 0001 c3c8 0000 0000 4400 0381
1513360 0001 c3e4 0000 0000 4400 0382 0001 c404 0000 0000 4400 0383 0001 c428 0000 0000 4400 0384 0001 c434 0000 0000 4400 0385
1513440 0001 c44c 0000 0000 4400 0387 0001 c458 0000 0000 4400 0388 0001 c464 0000 0000 4400 0389 0001 c474 0000 0000 4400 038d
1513520 0001 c488 0000 0000 4400 038e 0001 c4a4 0000 0000 4400 038f 0001 c4b0 0000 0000 4400 0390 0001 c4c0 0000 0000 4400 0391
1513600 0001 c4d0 0000 0000 4400 0392 0001 c4e4 0000 0000 4400 0393 0001 c4f4 0000 0000 4400 0394 0001 c52c 0000 0000 4400 039d
1513660 0001 c538 0000 0000 4400 039e 0001 c544 0000 0000 4400 03a0 0001 c54c 0000 0000 4400 03a1 0001 c55c 0000 0000 4400 03a5
1513740 0001 c56c 0000 0000 4400 03a6 0001 c588 0000 0000 4400 03a7 0001 c590 0000 0000 4400 03a8 0001 c5b4 0000 0000 4400 03a9
1514020 0001 c5d0 0000 0000 4400 03aa 0001 c5ec 0000 0000 4400 03ab 0001 c5fc 0000 0000 4400 03ac 0001 c620 0000 0000 4400 03ad
1514100 0001 c628 0000 0000 4400 03b2 0001 c640 0000 0000 4400 03b3 0001 c650 0000 0000 4400 03b7 0001 c65c 0000 0000 4400 03b8
1514160 0001 c66c 0000 0000 4400 03b9 0001 c6a4 0000 0000 4400 03be 0001 c6b0 0000 0000 4400 03bf 0001 c6c0 0000 0000 4400 03c0
1514240 0001 c6c8 0000 0000 4400 03c1 0001 c6d0 0000 0000 4400 03c2 0001 c6dc 0000 0000 4400 03c3 0001 c6e8 0000 0000 4400 03c4
1514320 0001 c704 0000 0000 4400 03c5 0001 c71c 0000 0000 4400 03c4 0001 c72c 0000 0000 4400 03c7 0001 c748 0000 0000 4400 03c8
1514400 0001 c758 0000 0000 4400 03c9 0001 c774 0000 0000 4400 03ca 0001 c790 0000 0000 4400 03cb 0001 c7a0 0000 0000 4400 03cc
1514460 0001 c7c8 0000 0000 4400 03cd 0001 c7d0 0000 0000 4400 03ce 0001 c7e4 0000 0000 4400 03cf 0001 c804 0000 0000 4400 03d0
1514540 0001 c824 0000 0000 4400 03cf 0001 c844 0000 0000 4400 03d5 0001 c858 0000 0000 4400 03d6 0001 c870 0000 0000 4400 03d5
1514620 0001 c890 0000 0000 4400 03d7 0001 c8a4 0000 0000 4400 03d8 0001 c8bc 0000 0000 4400 03d7 0001 c8dc 0000 0000 4400 03da
1514700 0001 c8f0 0000 0000 4400 03db 0001 c928 0000 0000 e000 0002 0000 2424 0000 0000 4400 03dc 0001 c934 0005 5c63 2400 0004
1514760 0001 c944 0005 5078 a000 007c 0000 0044 0005 5083 a000 0001 0000 0048 0005 5090 a000 0004 0000 004c 0000 0000 4400 03ef
1515040 0001 c944 0000 0000 4400 03ef 0001 c95c 0005 509c 8000 0004 ffff fffc 0005 50a6 8000 0030 ffff fff8 0005 50b1 8000 000c
1515120 ffff fff4 0005 50bb 8000 000c ffff fff0 0005 50c7 8000 0004 ffff ffec 0000 0000 c000 0002 0000 244c 0000 0000 4400 03f5
1515200 0001 c95c 0000 0000 4400 03f6 0001 c968 0000 0000 4400 03f7 0001 c96c 0000 0000 4400 03f8 0001 c97c 0000 0000 4400 03f9
1515260 0001 c984 0000 0000 4400 03fa 0001 c99c 0000 0000 4400 03fb 0001 c9a8 0000 0000 4400 03fc 0001 c9b0 0000 0000 4400 03fd
1515340 0001 c9bc 0000 0000 4400 03fe 0001 c9c4 0000 0000 4400 03ff 0001 c9ec 0000 0000 4400 0400 0001 c9fc 0000 0000 4400 0401
```

```
1515420 0001 ca2c 0000 0000 4400 0403 0001 ca44 0000 0000 4400 0404 0001 ca9c 0000 0000 4400 0405 0001 caac 0000 0000 4400 0406
1515500 0001 cac8 0000 0000 4400 0407 0001 cad8 0000 0000 4400 0409 0001 caf0 0000 0000 4400 040a 0001 cafc 0000 0000 4400 040b
1515560 0001 cb0c 0000 0000 e000 0002 0000 263c 0000 0000 4400 040c 0001 cb1c 0005 50d1 2400 0004 0001 cb2c 0005 50df a000 0004
1515640 0000 0044 0000 0000 4400 0415 0001 cb2c 0000 0000 4400 0415 0001 cb3c 0005 50ed 8000 007c ffff fffc 0005 50f7 8000 007c
1515720 ffff fff8 0005 510a 8000 000c ffff fff4 0000 0000 c000 0002 0000 262c 0000 0000 4400 041a 0001 cb3c 0000 0000 4400 041b
1516000 0001 cb74 0000 0000 4400 041c 0001 cb84 0000 0000 4400 041d 0001 cb8c 0000 0000 4400 041e 0001 cb98 0000 0000 4400 041f
1516060 0001 cba8 0000 0000 4400 0420 0001 cbb8 0000 0000 4400 0421 0001 cbe0 0000 0000 4400 0422 0001 cc18 0000 0000 4400 0427
1516140 0001 cc24 0000 0000 4400 0428 0001 cc44 0000 0000 4400 0429 0001 cc5c 0000 0000 4400 042b 0001 cc74 0000 0000 4400 0427
1516220 0001 cc80 0000 0000 4400 042f 0001 cc88 0000 0000 4400 0430 0001 cca4 0000 0000 4400 0431 0001 ccb8 0000 0000 4400 0432
1516300 0001 ccc8 0000 0000 4400 0433 0001 ccf0 0000 0000 4400 042f 0001 cd0c 0000 0000 4400 0438 0001 cd20 0000 0000 4400 0439
1516360 0001 cd48 0000 0000 4400 043a 0001 cd54 0000 0000 4400 043b 0001 cd60 0000 0000 4400 043c 0001 cd70 0000 0000 4400 043d
1516440 0001 cd80 0000 0000 4400 0442 0001 cd9c 0000 0000 4400 0443 0001 cda4 0000 0000 4400 0444 0001 cdac 0000 0000 4400 0445
1516520 0001 cdb8 0000 0000 4400 0446 0001 cdc8 0000 0000 4400 0447 0001 cdd8 0000 0000 4400 0448 0001 ce10 0000 0000 e000 0002
1516600 0000 290c 0000 0000 4400 0449 0001 ce1c 0005 5114 2400 0004 0001 ce2c 0005 5125 a000 007c 0000 0044 0000 0000 4400 0452
1516660 0001 ce2c 0000 0000 4400 0452 0001 ce3c 0005 5130 8000 000c ffff fffc 0000 0000 c000 0002 0000 292c 0000 0000 4400 0455
1516740 0001 ce3c 0000 0000 4400 0456 0001 ce50 0000 0000 4400 0457 0001 ce58 0000 0000 4400 0458 0001 ce78 0000 0000 4400 0459
1517020 0001 ce9c 0000 0000 4400 045b 0001 ceac 0000 0000 4400 0457 0001 ceb8 0000 0000 4400 045d 0001 cec0 0000 0000 e000 0002
1517100 0000 29bc 0000 0000 4400 045e 0001 cecc 0005 5143 2400 0004 0001 cedc 0005 5159 a000 007c 0000 0044 0000 0000 4400 0467
1517160 0001 cedc 0000 0000 4400 0467 0001 ceec 0005 5164 8000 000c ffff fffc 0005 516e 8000 0030 ffff fff8 0005 5179 8000 0014
1517240 ffff fff4 0005 5183 8000 0004 ffff fff0 0005 5191 8000 0004 ffff ffec 0005 51a1 8000 0004 ffff ffe8 0005 51af 8000 0004
1517320 ffff ffe4 0005 51bc 8000 0004 ffff ffe0 0005 51cb 8000 0004 ffff ffdc 0005 51db 8000 0004 ffff ffd8 0005 51ec 8000 0001
1517400 ffff ffd4 0000 0000 c000 0002 0000 29dc 0000 0000 4400 046e 0001 ceec 0000 0000 4400 046f 0001 cf24 0000 0000 4400 0470
1517460 0001 cf40 0000 0000 4400 0471 0001 cf50 0000 0000 4400 0472 0001 cf5c 0000 0000 4400 0473 0001 cf6c 0000 0000 4400 0474
1517540 0001 cf78 0000 0000 4400 0476 0001 cf80 0000 0000 4400 0477 0001 cf90 0000 0000 4400 0478 0001 cf9c 0000 0000 4400 0479
1517620 0001 cfb4 0000 0000 4400 047a 0001 cfc4 0000 0000 4400 047b 0001 cfd0 0000 0000 4400 047c 0001 cfe0 0000 0000 4400 047d
1517700 0001 cfec 0000 0000 4400 047e 0001 d020 0000 0000 4400 047f 0001 d034 0000 0000 4400 0480 0001 d03c 0000 0000 4400 0481
1517760 0001 d040 0000 0000 4400 0482 0001 d04c 0000 0000 4400 0483 0001 d068 0000 0000 4400 0484 0001 d074 0000 0000 4400 0485
1520040 0001 d084 0000 0000 4400 0486 0001 d094 0000 0000 4400 0487 0001 d0b0 0000 0000 4400 0488 0001 d0c0 0000 0000 4400 0489
1520120 0001 d0c8 0000 0000 4400 048a 0001 d0dc 0000 0000 4400 048b 0001 d0ec 0000 0000 4400 048c 0001 d100 0000 0000 4400 048d
1520200 0001 d110 0000 0000 4400 048e 0001 d120 0000 0000 4400 048f 0001 d130 0000 0000 4400 0490 0001 d140 0000 0000 4400 0491
1520260 0001 d154 0000 0000 4400 0492 0001 d164 0000 0000 4400 0493 0001 d170 0000 0000 4400 0494 0001 d1a4 0000 0000 4400 0495
1520340 0001 d1b8 0000 0000 4400 0497 0001 d1c8 0000 0000 4400 0498 0001 d1dc 0000 0000 4400 0482 0001 d1ec 0000 0000 4400 049a
1520420 0001 d200 0000 0000 4400 049b 0001 d234 0000 0000 4400 049c 0001 d244 0000 0000 4400 049d 0001 d260 0000 0000 4400 049e
1520500 0001 d270 0000 0000 4400 049f 0001 d288 0000 0000 4400 04a0 0001 d298 0000 0000 e000 0002 0000 2d90 0000 0000 4400 04a1
1520560 0001 d2a0 0005 51f7 2400 0004 0001 d2b0 0005 520a a000 007c 0000 0044 0000 0000 4400 04aa 0001 d2b0 0000 0000 4400 04aa
1520640 0001 d2c0 0005 5215 8000 0004 ffff fffc 0005 5223 8000 0004 ffff fff8 0005 522b 8000 0004 ffff fff4 0005 5238 8000 0004
1520720 ffff fff0 0005 5249 8000 0004 ffff ffec 0005 5258 8000 0001 ffff ffe8 0005 5263 8000 0014 ffff ffe4 0000 0000 c000 0002
1521000 0000 2db0 0000 0000 4400 04b0 0001 d2c0 0000 0000 4400 04b1 0001 d2f8 0000 0000 4400 04b2 0001 d308 0000 0000 4400 04b3
1521060 0001 d324 0000 0000 4400 04b4 0001 d344 0000 0000 4400 04b5 0001 d35c 0000 0000 4400 04b4 0001 d378 0000 0000 4400 04b6
1521140 0001 d38c 0000 0000 4400 04b7 0001 d3a8 0000 0000 4400 04b8 0001 d3bc 0000 0000 4400 04b9 0001 d3e4 0000 0000 4400 04ba
1521220 0001 d420 0000 0000 4400 04bc 0001 d430 0000 0000 4400 04bd 0001 d444 0000 0000 4400 04be 0001 d454 0000 0000 4400 04bf
1521300 0001 d464 0000 0000 4400 04c0 0001 d470 0000 0000 4400 04c1 0001 d47c 0000 0000 4400 04c2 0001 d488 0000 0000 4400 04c3
1521360 0001 d4a0 0000 0000 4400 04c4 0001 d4b4 0000 0000 4400 04c5 0001 d4c4 0000 0000 4400 04c6 0001 d4dc 0000 0000 4400 04c7
1521440 0001 d4f0 0000 0000 4400 04c8 0001 d500 0000 0000 4400 04c9 0001 d50c 0000 0000 4400 04ca 0001 d520 0000 0000 4400 04cb
1521520 0001 d534 0000 0000 4400 04c2 0001 d540 0000 0000 4400 04cd 0001 d554 0000 0000 e000 0002 0000 304c 0000 0000 4400 04ce
1521600 0001 d55c 0005 526d 2400 0004 0001 d56c 0005 5285 a000 0001 0000 0044 0005 5293 a000 0001 0000 0048 0005 52a2 a000 0001
1521660 0000 004c 0000 0000 4400 04e1 0001 d56c 0000 0000 4400 04e1 0001 d584 0005 52ac 8000 0004 ffff fffc 0005 52b4 8000 0004
1521740 ffff fff8 0005 52bc 8000 0004 ffff fff4 0005 52ca 8000 0014 ffff fff0 0005 52d4 8000 0001 ffff ff8c 0005 52f4 8000 0001
1522020 ffff ff28 0005 5301 8000 0001 ffff ff24 0005 530b 8000 0001 ffff ff20 0005 5319 8000 0004 ffff ff1c 0000 0000 c000 0002
1522100 0000 3074 0000 0000 4400 04e8 0001 d584 0000 0000 4400 04e9 0001 d589 0000 0000 4400 04ea 0001 d5bc 0000 0000 4400 04eb
1522160 0001 d5cc 0000 0000 4400 04ed 0001 d5d8 0000 0000 4400 04ee 0001 d5d8 0000 0000 4400 04ef 0001 d5f0 0000 0000 4400 04f0
1522240 0001 d630 0000 0000 4400 04f1 0001 d640 0000 0000 4400 04f2 0001 d654 0000 0000 4400 04f3 0001 d668 0000 0000 4400 04f4
1522320 0001 d68c 0000 0000 4400 04f6 0001 d698 0000 0000 4400 04f8 0001 d6a0 0000 0000 4400 04f9 0001 d6b0 0000 0000 4400 04fa
1522400 0001 d6c0 0000 0000 4400 04fb 0001 d6d0 0000 0000 4400 04fc 0001 d6e4 0000 0000 4400 04fd 0001 d6f4 0000 0000 4400 04fe
1522460 0001 d708 0000 0000 4400 04ff 0001 d72c 0000 0000 4400 0500 0001 d738 0000 0000 4400 0501 0001 d758 0000 0000 4400 0502
```

```
1522540  0001 d768 0000 0000 4400 0504 0001 d774 0000 0000 4400 0505 0001 d780 0000 0000 4400 0506 0001 d790 0000 0000 4400 0507
1522620  0001 d7a4 0000 0000 4400 0508 0001 d7b8 0000 0000 4400 0509 0001 d7c8 0000 0000 4400 050a 0001 d7d0 0000 0000 4400 050b
1522700  0001 d7d0 0000 0000 4400 050c 0001 d7d8 0000 0000 4400 050d 0001 d8a8 0000 0000 4400 050e 0001 d8e8 0000 0000 4400 050f
1522760  0001 d900 0000 0000 4400 0511 0001 d95c 0000 0000 4400 0512 0001 d964 0000 0000 4400 0513 0001 d970 0000 0000 4400 0514
1523040  0001 d9a0 0000 0000 4400 0515 0001 d9b4 0000 0000 4400 0516 0001 d9c4 0000 0000 4400 0517 0001 d9d8 0000 0000 4400 0518
1523120  0001 d9e8 0000 0000 4400 0519 0001 da10 0000 0000 4400 051b 0001 da24 0000 0000 4400 051c 0001 da50 0000 0000 4400 051d
1523200  0001 da60 0000 0000 4400 051f 0001 da6c 0000 0000 4400 0521 0001 da78 0000 0000 4400 0522 0001 da88 0000 0000 4400 0523
1523260  0001 da90 0000 0000 4400 0524 0001 daa0 0000 0000 4400 0526 0001 dab4 0000 0000 4400 0528 0001 dac0 0000 0000 4400 0529
1523340  0001 dad4 0000 0000 e000 0002 0000 35d4 0000 0000 4400 052a 0001 dae4 0005 5322 2400 000c 0001 daf4 0005 5332 a000 0001
1523420  0000 0044 0005 5340 a000 007c 0000 0048 0000 0000 4400 0538 0001 daf4 0000 0000 4400 0538 0001 db08 0005 534b 8000 000c
1523500  ffff fffc 0000 0000 c000 0002 0000 35f8 0000 0000 4400 053b 0001 db08 0000 0000 4400 053c 0001 db30 0000 0000 4400 053d
1523560  0001 db3c 0000 0000 e000 0002 0000 3638 0000 0000 4400 053e 0001 db48 0005 5356 2400 0214 0001 db58 0005 5366 a000 007c
1523640  0000 0044 0000 0000 4400 0547 0001 db58 0000 0000 4400 0547 0001 db68 0005 5371 8000 0214 ffff fffc 0000 0000 c000 0002
1523720  0000 3658 0000 0000 4400 054a 0001 db68 0000 0000 4400 054b 0001 db7c 0000 0000 4400 054d 0001 db9c 0000 0000 4400 054e
1524000  0001 dba8 0000 0000 4400 0550 0001 dbb8 0000 0000 4400 0551 0001 dbc4 0000 0000 4400 0552 0001 dbd0 0000 0000 4400 0553
1524060  0001 dbd8 0000 0000 4400 0554 0001 dbe8 0000 0000 4400 0555 0001 dbf4 0000 0000 e000 0002 0000 36f0 0000 0000 4400 0556
1524140  0001 dc0c 0005 537d 2400 0c30 0001 dc10 0005 5392 a000 007c 0000 0044 0005 539d a000 0001 0000 0048 0000 0000 4400 0560
1524220  0001 dc10 0000 0000 4400 0560 0001 dc24 0005 53ad 8000 0030 ffff fffc 0005 53b8 8000 0004 ffff fff8 0000 0000 c000 0002
1524300  0000 3714 0000 0000 4400 0564 0001 dc24 0000 0000 4400 0565 0001 dc3c 0000 0000 4400 0566 0001 dc54 0000 0000 4400 0567
1524360  0001 dc68 0000 0000 4400 0568 0001 dc74 0000 0000 4400 0569 0001 dc80 0000 0000 4400 056a 0001 dc9c 0000 0000 4400 056b
1524440  0001 dca4 0000 0000 4400 056c 0001 dcb8 0000 0000 e000 0002 0000 37b4 0000 0000 4400 056d 0001 dcc4 0005 53c3 2400 0004
1524520  0001 dcd4 0005 53d8 a000 0004 0000 0044 0005 53e6 a000 0001 0000 0048 0005 53f6 a000 0001 0000 004c 0000 0000 4400 0579
1524600  0001 dcd4 0000 0000 4400 0579 0001 dcec 0005 5405 8000 007c ffff fffc 0005 540f 8000 0214 ffff fff8 0005 541b 8000 0001
1524660  ffff fff7 0005 5426 8000 000c ffff fff0 0005 5431 8000 0030 ffff ffec 0005 543d 8000 0004 ffff ffe8 0000 0000 c000 0002
1524740  0000 37dc 0000 0000 4400 0581 0001 dcec 0000 0000 4400 0582 0001 dd2c 0000 0000 4400 0583 0001 dd3c 0000 0000 4400 0584
1525020  0001 dd44 0000 0000 4400 0585 0001 dd50 0000 0000 4400 0586 0001 dd88 0000 0000 4400 0587 0001 dd98 0000 0000 4400 0588
1525100  0001 dda4 0000 0000 4400 0589 0001 dde0 0000 0000 4400 058a 0001 dde0 0000 0000 4400 058b 0001 ddf8 0000 0000 4400 058d
1525160  0001 de20 0000 0000 4400 058e 0001 de20 0000 0000 4400 0590 0001 de34 0000 0000 4400 0591 0001 de48 0000 0000 4400 0592
1525240  0001 de58 0000 0000 4400 0593 0001 de6c 0000 0000 4400 0594 0001 de79 0000 0000 4400 0595 0001 deb4 0000 0000 4400 0596
1525320  0001 decc 0000 0000 4400 0597 0001 dedc 0000 0000 4400 0598 0001 dee8 0000 0000 4400 0599 0001 def0 0000 0000 4400 059a
1525400  0001 df08 0000 0000 4400 059b 0001 df2c 0000 0000 4400 059c 0001 df34 0000 0000 4400 059d 0001 df48 0000 0000 4400 059e
1525460  0001 df5c 0000 0000 4400 059f 0001 df5c 0000 0000 4400 05a2 0001 df70 0000 0000 4400 05a3 0001 df80 0000 0000 4400 05a4
1525540  0001 df8c 0000 0000 4400 05a6 0001 df98 0000 0000 4400 05a7 0001 dfa4 0000 0000 4400 05a8 0001 dfb8 0000 0000 4400 05a9
1525620  0001 dfc8 0000 0000 4400 05aa 0001 dfdc 0000 0000 4400 05ab 0001 e004 0000 0000 4400 05ac 0001 e018 0000 0000 4400 05ad
1525700  0001 e024 0000 0000 4400 05ae 0001 e030 0000 0000 4400 05af 0001 e038 0000 0000 4400 05b0 0001 e044 0000 0000 4400 05b1
1525760  0001 e054 0000 0000 4400 05b2 0001 e068 0000 0000 4400 05b3 0001 e074 0000 0000 4400 05b4 0001 e0b0 0000 0000 4400 05b5
1526040  0001 e0ec 0000 0000 4400 05b7 0001 e124 0000 0000 4400 05b8 0001 e130 0000 0000 4400 05bb 0001 e154 0000 0000 4400 05bc
1526120  0001 e168 0000 0000 4400 05bd 0001 e168 0000 0000 4400 05be 0001 e17c 0000 0000 4400 05bf 0001 e190 0000 0000 4400 05c0
1526200  0001 e1a4 0000 0000 4400 05c1 0001 e1bc 0000 0000 4400 05c2 0001 e1dc 0000 0000 4400 05c3 0001 e1f4 0000 0000 4400 05c4
1526260  0001 e208 0000 0000 4400 05c5 0001 e21c 0000 0000 4400 05c6 0001 e22c 0000 0000 4400 05c7 0001 e238 0000 0000 4400 05c8
1526340  0001 e244 0000 0000 4400 05ca 0001 e254 0000 0000 4400 05cb 0001 e29c 0000 0000 4400 05cc 0001 e2a8 0000 0000 4400 05cd
1526420  0001 e2a8 0000 0000 4400 05ce 0001 e300 0000 0000 4400 05cf 0001 e314 0000 0000 4400 05d0 0001 e324 0000 0000 4400 05d3
1526500  0001 e33c 0000 0000 e000 0002 0000 3e38 0000 0000 4400 05d4 0001 e348 0005 544b 2400 0004 0001 e358 0005 545e a000 007c
1526560  0000 0044 0005 5469 a000 0030 0000 0048 0000 0000 4400 05de 0001 e358 0000 0000 4400 05de 0001 e36c 0005 5475 8000 0004
1526640  ffff fffc 0005 5481 8000 0004 ffff fff8 0005 5489 8000 0001 ffff fff4 0000 0000 c000 0002 0000 3e5c 0000 0000 4400 05e2
1526720  0001 e36c 0000 0000 4400 05e3 0001 e394 0000 0000 4400 05e4 0001 e39c 0000 0000 4400 05e5 0001 e3ac 0000 0000 4400 05e6
1527000  0001 e3d0 0000 0000 4400 05e7 0001 e3e0 0000 0000 4400 05e8 0001 e3f8 0000 0000 4400 05e9 0001 e408 0000 0000 4400 05ea
1527060  0001 e418 0000 0000 4400 05eb 0001 e438 0000 0000 4400 05ea 0001 e4a8 0000 0000 4400 05e5 0001 e4bc 0000 0000 4400 05ed
1527140  0001 e4c4 0000 0000 4400 05ee 0001 e4d4 0000 0000 4400 05ef 0001 e4e0 0000 0000 4400 05f0 0001 e4ec 0000 0000 4400 05f1
1527220  0001 e4f8 0000 0000 4400 05f2 0001 e500 0000 0000 e000 0002 0000 3ff8 0000 0000 4400 05f3 0001 e508 0005 5491 2400 0004
1527300  0001 e518 0005 549f a000 0214 0000 0044 0000 0000 4400 05fc 0001 e518 0000 0000 4400 05fc 0001 e528 0000 0000 4400 05fd
1527360  0001 e528 0000 0000 4400 05fe 0001 e53c 0000 0000 4400 05ff 0001 e544 0000 0000 4400 0600 0001 e55c 0000 0000 4400 0601
1527440  0001 e568 0000 0000 4400 0602 0001 e594 0000 0000 4400 0603 0001 e5b4 0000 0000 4400 0604 0001 e5e0 0000 0000 4400 0605
1527520  0001 e600 0000 0000 4400 0606 0001 e620 0005 54aa 2400 0004 0001 e630 0005 54b8 a000 0004 0000 0044 0000 0000 4400 060f
1527600  0001 e630 0000 0000 4400 060f 0001 e640 0005 54c7 8000 0214 ffff fffc 0000 0000 c000 0002 0000 4130 0000 0000 4400 0612
```

```
1527660 0001 e640 0000 0000 4400 0613 0001 e678 0000 0000 4400 0614 0001 e688 0000 0000 4400 0615 0001 e690 0000 0000 4400 0616
1527740 0001 e6a0 0000 0000 4400 0617 0001 e6a8 0000 0000 4400 0619 0001 e6b8 0000 0000 4400 061a 0001 e6c8 0000 0000 4400 061b
1530020 0001 e6d4 0000 0000 4400 061c 0001 e6ec 0000 0000 4400 061d 0001 e6f8 0000 0000 4400 061e 0001 e70c 0000 0000 4400 061f
1530100 0001 e71c 0000 0000 4400 0620 0001 e728 0000 0000 4400 0621 0001 e740 0000 0000 4400 0622 0001 e748 0000 0000 4400 0623
1530160 0001 e748 0000 0000 4400 0624 0001 e770 0000 0000 4400 0626 0001 e780 0000 0000 e000 0002 0000 427c 0000 0000 4400 0627
1530240 0001 e78c 0005 54d1 2400 0004 0001 e79c 0005 54e0 a000 0004 0000 0044 0005 54ee a000 0001 0000 0048 0000 0000 4400 0631
1530320 0001 e79c 0000 0000 4400 0631 0001 e7b0 0005 54fe 8000 007c ffff fffc 0005 5508 8000 000c ffff fff8 0000 0000 c000 0002
1530400 0000 42a0 0000 0000 4400 0635 0001 e7b0 0000 0000 4400 0636 0001 e7ec 0000 0000 4400 0637 0001 e7fc 0000 0000 4400 0638
1530460 0001 e804 0000 0000 4400 0639 0001 e810 0000 0000 4400 063a 0001 e820 0000 0000 4400 063b 0001 e830 0000 0000 4400 063c
1530540 0001 e844 0000 0000 4400 063d 0001 e854 0000 0000 4400 063e 0001 e868 0000 0000 4400 063f 0001 e878 0000 0000 4400 0640
1530620 0001 e884 0000 0000 4400 0641 0001 e898 0000 0000 4400 0643 0001 e8ac 0000 0000 4400 0644 0001 e8c0 0000 0000 4400 0645
1530700 0001 e8c8 0000 0000 4400 0646 0001 e8e0 0000 0000 4400 0647 0001 e904 0000 0000 4400 0648 0001 e910 0000 0000 4400 064a
1530760 0001 e918 0000 0000 e000 0002 0000 4414 0000 0000 4400 064b 0001 e924 0005 5513 2400 0004 0001 e934 0005 5524 a000 0214
1531040 0000 0044 0000 0000 4400 0654 0001 e934 0000 0000 4400 0654 0001 e944 0005 552f 8000 0030 ffff fffc 0000 0000 c000 0002
1531120 0000 4434 0000 0000 4400 0657 0001 e944 0000 0000 4400 0658 0001 e954 0000 0000 4400 0659 0001 e964 0000 0000 4400 065a
1531200 0001 e974 0000 0000 4400 065b 0001 e988 0000 0000 4400 065c 0001 e994 0000 0000 4400 065d 0001 e9a4 0000 0000 4400 065e
1531260 0001 e9bc 0000 0000 4400 065f 0001 e9d4 0000 0000 4400 0660 0001 e9ec 0000 0000 4400 0661 0001 ea48 0000 0000 4400 0663
1531340 0001 ea60 0000 0000 4400 0664 0001 eaa0 0000 0000 4400 0665 0001 eab0 0000 0000 e000 0002 0000 45c4 0000 0000 4400 0666
1531420 0001 ead4 0005 553c 2400 0004 0001 eae4 0005 5549 a000 0004 0000 0044 0000 0000 4400 066f 0001 eae4 0000 0000 4400 066f
1531500 0001 eaf4 0005 5558 4000 0214 0000 001d 0000 0000 c000 0002 0000 45e4 0000 0000 4400 0672 0001 eaf4 0000 0000 4400 0673
1531560 0001 eaf8 0000 0000 4400 0674 0001 eb18 0000 0000 4400 0675 0001 eb34 0000 0000 e000 0002 0000 4678 0000 0000 4400 0676
1531640 0001 eb88 0005 5563 2400 0004 0001 eb98 0005 5572 a000 0004 0000 0044 0005 557c a000 0004 0000 0048 0000 0000 4400 0682
1531720 0001 eb98 0000 0000 4400 0682 0001 ebac 0005 558b 8000 0214 ffff fffc 0000 0000 c000 0002 0000 469c 0000 0000 4400 0685
1532000 0001 ebac 0000 0000 4400 0686 0001 ebb4 0000 0000 4400 0687 0001 ec04 0000 0000 4400 0688 0001 ec20 0000 0000 e000 0002
1532060 0000 4728 0000 0000 4400 0689 0001 ec38 0005 5595 2400 0004 0001 ec48 0005 55a6 a000 0001 0000 0044 0005 55b0 a000 0214
1532140 0000 0048 0000 0000 4400 0693 0001 ec48 0000 0000 4400 0693 0001 ec5c 0005 55bb 8000 007c ffff fffc 0005 55c5 8000 0004
1532220 ffff fff8 0005 55d3 8000 0030 ffff fff4 0000 0000 c000 0002 0000 474c 0000 0000 4400 0698 0001 ec5c 0000 0000 4400 0699
1532300 0001 ec6c 0000 0000 4400 069a 0001 ec7c 0000 0000 4400 069b 0001 ec88 0000 0000 4400 069c 0001 ec94 0000 0000 4400 069d
1532360 0001 eca4 0000 0000 4400 069e 0001 ecd0 0000 0000 4400 069f 0001 ecec 0000 0000 4400 06a0 0001 ed00 0000 0000 4400 06a1
1532440 0001 ed0c 0000 0000 4400 06a3 0001 ed1c 0000 0000 4400 06a4 0001 ed28 0000 0000 4400 06a5 0001 ed40 0000 0000 4400 06a6
1532520 0001 ed6c 0000 0000 4400 06a7 0001 ed8c 0000 0000 4400 06a8 0001 eda8 0000 0000 4400 06aa 0001 edb8 0000 0000 4400 06ab
1532600 0001 edc4 0000 0000 4400 06ac 0001 edd0 0000 0000 4400 06ad 0001 eddc 0000 0000 4400 06ae 0001 edec 0000 0000 e000 0002
1532660 0000 48f8 0000 0000 4400 06af 0001 ee08 0005 55df 2400 0004 0001 ee18 0005 55ec a000 0004 0000 0044 0005 55f6 a000 0004
1532740 0000 0048 0000 0000 4400 06b9 0001 ee18 0000 0000 4400 06b9 0001 ee2c 0005 5605 4000 0214 0000 001d 0000 0000 c000 0002
1533020 0000 491c 0000 0000 4400 06bc 0001 ee2c 0000 0000 4400 06b1 0001 ee30 0000 0000 4400 06be 0001 ee50 0000 0000 4400 06c0
1533100 0001 ee6c 0000 0000 4400 06c1 0001 ee80 0000 0000 4400 06c2 0001 ee94 0000 0000 4400 06c3 0001 efb8 0000 0000 4400 06c4
1533160 0001 efcc 0000 0000 4400 06c5 0001 efe0 0000 0000 4400 06c7 0001 eff4 0000 0000 4400 06c8 0001 f018 0000 0000 4400 06ca
1533240 0001 f030 0000 0000 4400 06cb 0001 f048 0000 0000 e000 0002 0000 4b48 0000 0000 4400 06cc 0001 f058 0005 5610 2400 0004
1533320 0001 f068 0005 561d a000 0001 0000 0044 0005 5629 a000 0004 0000 0048 0005 5635 a000 0004 0000 004c 0005 5642 a000 0004
1533400 0000 0050 0000 0000 4400 06db 0001 f068 0005 564d 4000 0001 0000 0018 0000 0000 4400 06db 0001 f080 0005 5659 4000 0004
1533460 0000 001d 0005 5662 4000 0001 0000 001c 0005 566c 8000 0004 ffff fffc 0005 5674 8000 0004 ffff fff8 0005 567c 8000 0004
1533540 ffff fff4 0005 5688 8000 0004 ffff fff0 0005 5694 8000 0214 ffff ffec 0000 0000 c000 0002 0000 4b70 0000 0000 4400 06e1
1533620 0001 f080 0000 0000 4400 06e2 0001 f0bc 0000 0000 4400 06e4 0001 f0d8 0000 0000 4400 06e5 0001 f0e0 0000 0000 4400 06e6
1533700 0001 f0f8 0000 0000 4400 06e8 0001 f104 0000 0000 4400 06e9 0001 f110 0000 0000 4400 06ea 0001 f128 0000 0000 4400 06eb
1533760 0001 f130 0000 0000 4400 06ec 0001 f130 0000 0000 4400 06ed 0001 f140 0000 0000 4400 06ee 0001 f168 0000 0000 4400 06ef
1534040 0001 f178 0000 0000 4400 06f0 0001 f198 0000 0000 4400 06f1 0001 f1a4 0000 0000 4400 06f2 0001 f1b4 0000 0000 4400 06f4
1534120 0001 f1cc 0000 0000 4400 06f5 0001 f1dc 0000 0000 4400 06f7 0001 f1e4 0000 0000 4400 06f8 0001 f1fc 0000 0000 4400 06f9
1534200 0001 f20c 0000 0000 4400 06fa 0001 f21c 0000 0000 4400 06fc 0001 f228 0000 0000 4400 06fd 0001 f234 0000 0000 4400 06fe
1534260 0001 f240 0000 0000 4400 06ff 0001 f24c 0000 0000 4400 06e9 0001 f25c 0000 0000 4400 0701 0001 f270 0000 0000 e000 0002
1534340 0000 4d6c 0000 0000 4400 0702 0001 f27c 0005 569f 2400 0004 0001 f28c 0005 56ac a000 0001 0000 0044 0005 56b8 a000 0001
1534420 0000 0048 0005 56c8 a000 0004 0000 004c 0005 56d8 a000 0004 0000 0050 0000 0000 4400 0712 0001 f28c 0000 0000 4400 0712
1534500 0001 f2a8 0005 56e7 4000 0001 0000 001d 0005 56f2 4000 0001 0000 001c 0005 56fc 4000 0004 0000 001b 0005 5709 4000 0004
1534560 0000 001a 0005 5716 8000 0214 ffff fffc 0005 5720 8000 0004 ffff fff8 0005 572e 2800 0001 0004 a4f0 0000 0000 4400 0717
1534640 0001 f2a8 0000 0000 c000 0002 0000 4d98 0000 0000 4400 0719 0001 f2a8 0000 0000 4400 071b 0001 f2b0 0000 0000 4400 071c
1534720 0001 f320 0000 0000 4400 071d 0001 f33c 0000 0000 4400 071e 0001 f374 0000 0000 4400 071f 0001 f3b0 0000 0000 4400 0720
```

```
1535000  0001 f3c8 0000 0000 4400 071f 0001 f3e8 0000 0000 4400 0721 0001 f3f0 0000 0000 4400 0722 0001 f3fc 0000 0000 4400 0723
1535060  0001 f408 0000 0000 4400 0724 0001 f40c 0000 0000 4400 0725 0001 f40c 0000 0000 4400 0726 0001 f418 0000 0000 4400 0727
1535140  0001 f450 0000 0000 4400 0728 0001 f460 0000 0000 4400 0729 0001 f474 0000 0000 4400 072a 0001 f47c 0000 0000 4400 072b
1535220  0001 f494 0000 0000 4400 072c 0001 f49c 0000 0000 4400 072f 0001 f4ac 0000 0000 4400 0730 0001 f4bc 0000 0000 4400 0731
1535300  0001 f4c4 0000 0000 4400 0732 0001 f4e4 0000 0000 4400 0733 0001 f4f0 0000 0000 4400 0734 0001 f50c 0000 0000 4400 0735
1535360  0001 f514 0000 0000 4400 0736 0001 f52c 0000 0000 4400 0737 0001 f53c 0000 0000 4400 0738 0001 f548 0000 0000 4400 0739
1535440  0001 f554 0000 0000 4400 073b 0001 f55c 0000 0000 4400 073c 0001 f56c 0000 0000 4400 073d 0001 f574 0000 0000 4400 073e
1535520  0001 f598 0000 0000 4400 073f 0001 f5ac 0000 0000 4400 0740 0001 f5b4 0000 0000 4400 0741 0001 f5c0 0000 0000 4400 0742
1535600  0001 f5c8 0000 0000 4400 0743 0001 f5e0 0000 0000 4400 0742 0001 f5fc 0000 0000 4400 0744 0001 f604 0000 0000 e000 0002
1535660  0000 5100 0000 0000 4400 0745 0001 f610 0005 5751 2400 0004 0001 f620 0005 5763 a000 0001 0000 0044 0005 576f a000 0001
1535740  0000 0048 0000 0000 4400 0753 0001 f620 0000 0000 4400 0753 0001 f634 0005 577f 4000 0001 0000 001d 0005 5789 4000 0001
1536020  0000 001c 0005 5795 4000 0004 0000 001b 0005 57a2 4000 0214 0000 001a 0005 57ad 8000 0004 ffff fffc 0000 0000 c000 0002
1536100  0000 5124 0000 0000 4400 075a 0001 f634 0000 0000 4400 075b 0001 f65c 0000 0000 4400 075c 0001 f68c 0000 0000 4400 075d
1536160  0001 f6a8 0000 0000 4400 075e 0001 f6b0 0000 0000 4400 075f 0001 f6b4 0000 0000 4400 0760 0001 f6b4 0000 0000 4400 0761
1536240  0001 f6b8 0000 0000 4400 0762 0001 f6e8 0000 0000 4400 0763 0001 f6f4 0000 0000 4400 0764 0001 f710 0000 0000 4400 0765
1536320  0001 f71c 0000 0000 4400 0766 0001 f72c 0000 0000 4400 0767 0001 f744 0000 0000 4400 0768 0001 f754 0000 0000 4400 0769
1536400  0001 f760 0000 0000 4400 076a 0001 f774 0000 0000 4400 076b 0001 f784 0000 0000 4400 076c 0001 f790 0000 0000 4400 076d
1536460  0001 f7a4 0000 0000 e000 0002 0000 52ac 0000 0000 4400 076f 0001 f7bc 0005 57bd 2400 0004 0001 f7cc 0005 57cb a000 0001
1536540  0000 0044 0005 57d6 a000 0004 0000 0048 0005 57e2 a000 0004 0000 004c 0005 57ef a000 0004 0000 0050 0000 0000 4400 077e
1536620  0001 f7cc 0000 0000 4400 077e 0001 f7e8 0005 57fe 4000 0004 0000 001d 0005 5807 4000 0004 0000 001c 0000 0000 c000 0002
1536700  0000 52d8 0000 0000 4400 0781 0001 f7e8 0000 0000 4400 0782 0001 f810 0000 0000 4400 0784 0001 f82c 0000 0000 4400 0785
1536760  0001 f83c 0000 0000 4400 0786 0001 f84c 0000 0000 4400 0785 0001 f86c 0000 0000 4400 0784 0001 f878 0000 0000 4400 0787
1537040  0001 f884 0000 0000 e000 0002 0000 5380 0000 0000 4400 0788 0001 f890 0005 5810 2400 0004 0001 f8a0 0005 581f a000 0004
1537120  0000 0044 0005 582e a000 0001 0000 0048 0005 583c a000 0001 0000 004c 0005 5846 a000 0001 0000 0050 0005 5850 a000 0001
1537200  0000 0054 0005 585a a000 0001 0000 0058 0005 5864 a000 0001 0000 005c 0005 586e a000 0001 0000 0060 0000 0000 4400 0794
1537260  0001 f8a0 0000 0000 4400 0794 0001 f8c4 0005 5878 8000 0001 ffff fefc 0005 5898 8000 0001 ffff fef8 0000 0000 c000 0002
1537340  0000 53b4 0000 0000 4400 0798 0001 f8c4 0000 0000 4400 0799 0001 f8ec 0000 0000 4400 079b 0001 f908 0000 0000 4400 079c
1537420  0001 f938 0000 0000 4400 079d 0001 f93c 0000 0000 4400 079e 0001 f944 0000 0000 4400 079f 0001 f95c 0000 0000 e000 0002
1537500  0000 5474 0000 0000 4400 07a0 0001 f994 0005 58a2 2400 0004 0001 f994 0005 58b2 a000 000c 0000 0044 0005 58bc a000 000c
1537560  0000 0048 0000 0000 4400 07ad 0001 f994 0000 0000 4400 07ad 0001 f9a8 0000 0000 4400 07ae 0001 f9a8 0000 0000 4400 07af
1537640  0001 f9ec 0005 58c6 2400 0008 0001 f9fc 0005 58db a000 0004 0000 0044 0005 58e9 a000 0004 0000 0048 0000 0000 4400 07bb
1537720  0001 f9fc 0000 0000 4400 07bb 0001 fa10 0005 58f8 2800 0008 0004 a5f0 0000 0000 4400 07bc 0001 fa10 0005 5909 8000 007c
1540000  ffff fffc 0005 5913 8000 0030 ffff fff8 0005 5920 8000 000c ffff fff4 0000 0000 c000 0002 0000 5500 0000 0000 4400 07c1
1540060  0001 fa10 0000 0000 4400 07c2 0001 fa48 0000 0000 4400 07c3 0001 fa50 0000 0000 4400 07c4 0001 fa60 0000 0000 4400 07c6
1540140  0001 fa6c 0000 0000 4400 07c7 0001 fa78 0000 0000 4400 07c8 0001 fa8c 0000 0000 4400 07ca 0001 fa98 0000 0000 4400 07cb
1540220  0001 fabc 0000 0000 4400 07cc 0001 fad0 0000 0000 4400 07cd 0001 fadc 0000 0000 4400 07ce 0001 fb00 0000 0000 4400 07d0
1540300  0001 fb0c 0000 0000 4400 07d2 0001 fb24 0000 0000 4400 07d5 0001 fb38 0000 0000 4400 07d6 0001 fb4c 0000 0000 4400 07d8
1540360  0001 fb58 0000 0000 4400 07d9 0001 fb68 0000 0000 4400 07da 0001 fb78 0000 0000 4400 07db 0001 fb88 0000 0000 e000 0002
1540440  0000 5688 0000 0000 4400 07dc 0001 fb98 0005 592a 2400 0004 0001 fba8 0005 5937 a000 0004 0000 0044 0005 5945 a000 0001
1540520  0000 0048 0000 0000 4400 07e6 0001 fba8 0000 0000 4400 07e6 0001 fbbc 0005 5955 8000 007c ffff fffc 0005 595f 8000 0030
1540600  ffff fff8 0005 596c 8000 000c ffff fff4 0000 0000 c000 0002 0000 56ac 0000 0000 4400 07eb 0001 fbbc 0000 0000 4400 07ec
1540660  0001 fbf8 0000 0000 4400 07ed 0001 fc08 0000 0000 4400 07ee 0001 fc10 0000 0000 4400 07ef 0001 fc1c 0000 0000 4400 07f0
1540740  0001 fc2c 0000 0000 4400 07f1 0001 fc38 0000 0000 4400 07f2 0001 fc4c 0000 0000 4400 07f3 0001 fc5c 0000 0000 4400 07f4
1541020  0001 fc68 0000 0000 4400 07f5 0001 fc74 0000 0000 4400 07f6 0001 fc84 0000 0000 4400 07f7 0001 fc94 0000 0000 e000 0002
1541100  0000 5794 0000 0000 4400 07f8 0001 fca4 0005 5976 2400 0014 0001 fcb4 0005 598b a000 0214 0000 0044 0005 5996 a000 0004
1541160  0000 0048 0000 0000 4400 0802 0001 fcb4 0000 0000 4400 0802 0001 fcc8 0005 59a3 8000 0014 ffff fffc 0000 0000 c000 0002
1541240  0000 57b8 0000 0000 4400 0805 0001 fcc6 0000 0000 4400 0806 0001 fd00 0000 0000 4400 0807 0001 fd10 0000 0000 4400 0809
1541320  0001 fd1c 0000 0000 4400 080a 0001 fd30 0000 0000 4400 080b 0001 fd40 0000 0000 4400 080c 0001 fd54 0000 0000 4400 080d
1541400  0001 fd6c 0000 0000 4400 080e 0001 fd84 0000 0000 4400 080f 0001 fd94 0000 0000 e000 0002 0000 5890 0000 0000 4400 0810
1541460  0001 fda0 0005 59b1 2400 0014 0001 fdb0 0005 59c1 a000 0004 0000 0044 0000 0000 4400 0819 0001 fdb0 0000 0000 4400 0819
1541540  0001 fdc0 0000 0000 4400 081a 0001 fdc0 0000 0000 4400 081b 0001 fdf8 0000 0000 4400 081c 0001 fe08 0000 0000 4400 081d
1541620  0001 fe14 0000 0000 4400 081e 0001 fe24 0005 59cb 2400 0001 0001 fe34 0005 59db a000 0001 0000 0044 0005 59e6 a000 0001
1541700  0000 0048 0005 59f2 a000 0004 0000 004c 0000 0000 4400 082c 0001 fe34 0000 0000 4400 082c 0001 fe4c 0005 59fc 8000 000c
1541760  ffff fffc 0000 0000 c000 0002 0000 593c 0000 0000 4400 082f 0001 fe4c 0000 0000 4400 0830 0001 fe84 0000 0000 4400 0831
1542040  0001 fe94 0000 0000 4400 0833 0001 fea8 0000 0000 4400 0834 0001 febc 0000 0000 4400 0835 0001 fef4 0000 0000 e000 0002
```

```
1542120  0000 59f0 0000 0000 4400 0836 0001 ff00 0005 5a06 2400 0004 0001 ff10 0005 5a19 a000 0001 0000 0044 0005 5a24 a000 0004
1542200  0000 0048 0000 0000 4400 0842 0001 ff10 0000 0000 4400 0842 0001 ff24 0005 5a33 8000 0214 ffff fffc 0005 5a3d 8000 0001
1542260  ffff fff8 0000 0000 c000 0002 0000 5a14 0000 0000 4400 0846 0001 ff24 0000 0000 4400 0847 0001 ff5c 0000 0000 4400 0848
1542340  0001 ff94 0000 0000 4400 0849 0001 ffa0 0000 0000 4400 084a 0001 ffa8 0000 0000 4400 084b 0001 ffc0 0000 0000 4400 084c
1542420  0001 ffcc 0000 0000 4400 084d 0001 ffec 0000 0000 4400 084e 0002 001c 0000 0000 4400 084c 0002 0028 0000 0000 4400 084f
1542500  0002 003c 0000 0000 4400 0850 0002 0058 0000 0000 e000 0002 0000 5b54 0000 0000 4400 0851 0002 0064 0005 5a47 2400 0004
1542560  0002 0074 0005 5a5d a000 0004 0000 0044 0000 0000 4400 085a 0002 0074 0000 0000 4400 085a 0002 0084 0005 5a6b 8000 007c
1542640  ffff fffc 0005 5a75 8000 0004 ffff fff8 0005 5a83 8000 000c ffff fff4 0000 0000 c000 0002 0000 5b74 0000 0000 4400 085f
1542720  0002 0084 0000 0000 4400 0860 0002 00bc 0000 0000 4400 0861 0002 00c4 0000 0000 4400 0862 0002 00cc 0000 0000 4400 0864
1543000  0002 00f0 0000 0000 4400 0865 0002 0138 0000 0000 4400 0866 0002 0144 0000 0000 4400 0867 0002 0160 0000 0000 4400 0866
1543060  0002 0188 0000 0000 4400 0868 0002 019c 0000 0000 e000 0002 0000 5ca8 0000 0000 440c 0869 0002 01b8 0005 5a8d 2400 0004
1543140  0002 01c0 0005 5a9d a000 0001 0000 0044 0000 0000 4400 0876 0002 01c8 0000 0000 4400 0876 0002 01d8 0000 0000 4400 0877
1543220  0002 01d8 0000 0000 4400 0878 0002 0214 0000 0000 4400 0879 0002 0228 0000 0000 4400 087a 0002 0228 0000 0000 4400 087b
1543300  0002 0244 0000 0000 4400 087c 0002 0250 0000 0000 4400 087d 0002 025c 0005 5aa6 2400 0004 0002 026c 0005 5ab7 a000 0004
1543360  0000 0044 0005 5ac6 a000 0001 0000 0048 0005 5ad2 a000 0001 0000 004c 0000 0000 4400 0887 0002 026c 0000 0000 4400 0887
1543440  0002 0284 0005 5ae0 8000 0214 ffff fffc 0005 5aea 8000 0001 ffff ffd4 0000 0000 c000 0002 0000 5d74 0000 0000 4400 088b
1543520  0002 0284 0000 0000 4400 088c 0002 028c 0000 0000 4400 088d 0002 029c 0000 0000 4400 088e 0002 02b0 0000 0000 4400 088f
1543600  0002 02bc 0000 0000 4400 0890 0002 02c4 0000 0000 4400 0891 0002 02d0 0000 0000 4400 0892 0002 0310 0000 0000 4400 0893
1543660  0002 0320 0000 0000 4400 0894 0002 0330 0000 0000 4400 0895 0002 0348 0000 0000 4400 0896 0002 0364 0000 0000 4400 0898
1543740  0002 037c 0000 0000 e000 0002 0000 5e7c 0000 0000 4400 0899 0002 038c 0005 5b0c 2400 0004 0002 039c 0005 5b1b a000 0001
1544020  0000 0044 0005 5b24 a000 0004 0000 0048 0005 5b2e a000 0004 0000 004c 0005 5b38 a000 0004 0000 0050 0005 5b42 a000 0004
1544100  0000 0054 0000 0000 4400 08a4 0002 039c 0000 0000 4400 08a4 0002 03bc 0005 5b4c 8000 0001 ffff fffc 0005 5b57 8000 0001
1544160  ffff fff8 0000 0000 c000 0002 0000 5eac 0000 0000 4400 08a7 0002 03bc 0000 0000 4400 08a8 0002 03ec 0000 0000 4400 08a9
1544240  0002 03f8 0000 0000 4400 08ab 0002 040c 0000 0000 4400 08ac 0002 0418 0000 0000 4400 08ae 0002 0424 0000 0000 4400 08af
1544320  0002 0438 0000 0000 4400 08b0 0002 045c 0000 0000 4400 08b1 0002 0470 0000 0000 4400 08b2 0002 0484 0000 0000 4400 08b3
1544400  0002 048c 0000 0000 4400 08b4 0002 04a0 0000 0000 4400 08b5 0002 04c4 0000 0000 e000 0002 0000 5fc8 0000 0000 4400 08b6
1544460  0002 04d8 0005 5b62 2400 0004 0002 04e8 0005 5b72 a000 0001 0000 0044 0005 5b7b a000 0004 0000 0048 0005 5b85 a000 0004
1544540  0000 004c 0005 5b8f a000 0004 0000 0050 0005 5b99 a000 0004 0000 0054 0000 0000 4400 08c1 0002 04e8 0000 0000 4400 08c1
1544620  0002 0508 0005 5ba3 8000 0010 ffff fffc 0005 5bb6 8000 0001 ffff fffb 0000 0000 c000 0002 0000 5ff8 0000 0000 4400 08c5
1544700  0002 0508 0000 0000 4400 08c6 0002 0528 0000 0000 4400 08c7 0002 062c 0000 0000 4400 08c8 0002 0644 0000 0000 4400 08c9
1544760  0002 0658 0000 0000 4400 08cb 0002 0670 0000 0000 4400 08cc 0002 06a8 0000 0000 4400 08cd 0002 06a8 0000 0000 4400 08cf
1545040  0002 06e8 0000 0000 4400 08d0 0002 06f4 0000 0000 4400 08d1 0002 071c 0000 0000 4400 08d2 0002 0734 0000 0000 4400 08d3
1545120  0002 0748 0000 0000 4400 08d4 0002 0758 0000 0000 4400 08d5 0002 0768 0000 0000 4400 08d7 0002 0780 0000 0000 4400 08d8
1545200  0002 0790 0000 0000 4400 08da 0002 07a0 0000 0000 4400 08db 0002 07b8 0000 0000 4400 08dc 0002 07d0 0000 0000 4400 08dd
1545260  0002 07e0 0000 0000 4400 08de 0002 07f4 0000 0000 4400 08df 0002 0804 0000 0000 4400 08e0 0002 0818 0000 0000 4400 08e1
1545340  0002 0830 0000 0000 4400 08e2 0002 0844 0000 0000 4400 08e3 0002 085c 0000 0000 4400 08e4 0002 0874 0000 0000 4400 08e5
1545420  0002 0890 0000 0000 4400 08e7 0002 08a4 0000 0000 4400 08e9 0002 08c4 0000 0000 4400 08eb 0002 08d4 0000 0000 4400 08ed
1545500  0002 08ec 0000 0000 e000 0002 0000 63e8 0000 0000 4400 08ee 0002 08f8 0005 5bc4 2400 0004 0002 0908 0005 5bd5 a000 0001
1545560  0000 0044 0005 5bde a000 0004 0000 0048 0005 5be8 a000 0004 0000 004c 0005 5bf2 a000 0004 0000 0050 0005 5bfc a000 0004
1545640  0000 0054 0000 0000 4400 08f9 0002 0908 0000 0000 4400 08f9 0002 0928 0000 0000 4400 08fa 0002 0928 0000 0000 4400 08fb
1545720  0002 0944 0000 0000 4400 08fc 0002 094c 0000 0000 4400 08fd 0002 095c 0000 0000 4400 08fe 0002 0978 0000 0000 4400 08ff
1546000  0002 0a7c 0005 5c06 2400 0001 0002 0a8c 0005 5c16 a000 0014 0000 0044 0000 0000 4400 0903 0002 0a8c 0000 0000 4400 0903
1546060  0002 0a9c 0005 5c21 8000 0001 ffff ffac 0005 5c2d 8000 0001 ffff ff98 0005 5c35 8000 0004 ffff ff94 0005 5c3d 8000 0004
1546140  ffff ff90 0000 0000 c000 0002 0000 658c 0000 0000 4400 0908 0002 0a9c 0000 0000 4400 0909 0002 0ac0 0000 0000 4400 090a
1546220  0002 0acc 0000 0000 4400 090b 0002 0afc 0000 0000 4400 090c 0002 0b00 0000 0000 4400 090d 0002 0b20 0000 0000 4400 090e
1546300  0002 0b34 0000 0000 4400 090f 0002 0b74 0000 0000 4400 0910 0002 0b90 0000 0000 4400 0911 0002 0bd0 0000 0000 4400 090c
1546360  0002 0be4 0000 0000 4400 0914 0002 0bf8 0000 0000 e000 0002 0000 66f4 0000 0000 4400 0915 0002 0c04 0005 5c46 2400 0004
1546440  0002 0c14 0000 0000 4400 0918 0002 0c14 0000 0000 4400 0918 0002 0c20 0005 5c57 8000 0014 ffff fffc 0005 5c61 8000 0001
1546520  ffff fff8 0005 5c69 8000 0001 ffff fff0 0000 0000 c000 0002 0000 6710 0000 0000 4400 091d 0002 0c20 0000 0000 4400 091e
1546600  0002 0c2c 0000 0000 4400 091f 0002 0c48 0000 0000 4400 0920 0002 0c58 0000 0000 4400 0921 0002 0c60 0000 0000 4400 0922
1546660  0002 0c64 0000 0000 4400 0923 0002 0c70 0000 0000 4400 0924 0002 0c78 0000 0000 4400 0925 0002 0c8c 0000 0000 4400 0926
1546740  0002 0c94 0000 0000 4400 0927 0002 0ca0 0000 0000 4400 0929 0002 0ca8 0000 0000 4400 0929 0002 0cb8 0000 0000 4400 092a
1547020  0002 0cc0 0000 0000 4400 092b 0002 0ce8 0000 0000 4400 092c 0002 0cf8 0000 0000 4400 092e 0002 0d04 0000 0000 4400 092f
1547100  0002 0d14 0000 0000 4400 0930 0002 0d24 0000 0000 4400 0931 0002 0d30 0000 0000 4400 0932 0002 0d50 0000 0000 4400 0933
1547160  0002 0d74 0000 0000 4400 0934 0002 0d94 0000 0000 4400 0935 0002 0da8 0000 0000 4400 0936 0002 0dbc 0000 0000 4400 0937
```

```
1547240 0002 0ddc 0000 0000 4400 0938 0002 0df0 0000 0000 4400 0939 0002 0dfc 0000 0000 4400 093a 0002 0e1c 0000 0000 4400 093b
1547320 0002 0e44 0000 0000 4400 093c 0002 0e64 0000 0000 4400 093e 0002 0e78 0000 0000 4400 093f 0002 0e9d 0000 0000 4400 0941
1547400 0002 0ea0 0000 0000 4400 0943 0002 0eb8 0000 0000 4400 0944 0002 0ecc 0000 0000 4400 0945 0002 0edc 0000 0000 4400 0947
1547460 0002 0ee8 0000 0000 e000 0002 0000 69e4 0000 0000 4400 0948 0002 0ef4 0005 5c75 0400 0000 0002 0f08 0005 5c7e 0400 0000
1547540 0002 0fc8 0005 5c88 0400 0000 0002 0f90 0005 5c91 0400 0000 0002 1eb4 0005 5c9f 0600 0000 0004 015c 0005 5ca9 0400 0000
1547620 0002 225d 0005 5cb6 0400 0000 0002 2314 0005 5cc1 0400 0000 0002 1e58 0005 5ccb 0400 0000 0002 2024 0005 5cd5 0600 0000
1547700 0004 02e4 0005 5cdc 0400 0000 0002 1fb0 0005 5ce7 0400 0000 0002 2088 0005 5cf2 0600 0000 0004 0320 0005 5cfd 0600 0000
1547760 0004 02a4 0005 5d08 0600 0000 0004 03a0 0005 5d14 0400 0000 0002 1094 0005 5d23 0600 0000 0004 0260 0005 5d2a 0400 0000
1550040 0002 26cc 0005 5d35 0400 0000 0002 1054 0005 5d3e 6400 0000 0002 0f08 0005 5d65 6400 0000 0002 0f08 0005 5d6e 8000 0000
1550120 0000 0000 0005 5d98 8000 0000 0000 0000 0005 5db2 8000 0000 0000 0000 0005 5ddd 8000 0000 0000 0000 0005 5dff 8000 0000
1550200 0000 0000 0005 5e22 8000 0000 0000 0000 0005 5e48 8000 0000 0000 0000 0005 5e6a 8000 0000 0000 0000 0005 5e8b 8000 0000
1550260 0000 0000 0005 5ea4 8000 0000 0000 0000 0005 5ebf 8000 0000 0000 0000 0005 5ed3 8000 0000 0000 0000 0005 5ee5 2600 0001
1550340 0004 0260 0005 5f06 c200 0000 0000 0ff2 0005 5f1b 8200 0000 0000 1b24 0005 5f27 8400 0000 0002 0f08 0005 5f33 2600 0001
1550420 0004 02a4 0005 5f57 8200 0000 0000 2882 0005 5f79 8400 0000 0002 0f08 0005 5f9b 2600 0001 0004 02e4 0005 5fbb 8000 0001
1550500 ffff fb05 0005 603d 8000 0004 ffff fb05 0005 604c 8000 0004 ffff fb05 0005 607c 8000 0004 ffff fb05 0000 0000 a200 0000
1550560 0000 0000 0005 609c 2000 0004 0000 0000 0005 60b1 2000 0004 0000 0000 0005 60c1 2000 0004 0000 0000 0000 0000 a200 0000
1550640 0000 0000 0005 60e0 8200 0000 0000 0bf9 0005 60ec 8400 0000 0002 0f08 0005 60f8 2600 0001 0004 0320 0005 6109 c200 0000
1550720 0000 0000 0005 6115 c200 0000 0000 07e7 0005 6137 8000 0004 ffff fb05 0000 0000 a200 0000 0000 0000 0005 6149 8200 0000
1551000 0000 0e73 0005 6154 8400 0000 0002 0f08 0005 615f 2600 0001 0004 035c 0005 6170 8000 0001 ffff fb05 0005 6186 2000 0004
1551060 0000 0000 0000 0000 a200 0000 0000 0000 0005 6197 8000 0001 ffff fb05 0005 61a5 8000 0458 ffff fb05 0005 6291 8000 0458
1551140 ffff fb05 0005 6337 8000 0458 ffff fb05 0005 63f9 8000 0458 ffff fb05 0005 64a1 8000 0458 ffff fb05 0005 64b8 2600 0004
1551220 0004 03a0 0005 64dd 2400 0004 0002 0f08 0005 64e1 a000 0001 0000 0044 0005 64fa a000 0004 0000 0048 0005 6507 a000 0001
1551300 0000 004c 0005 6512 8400 0000 0002 0f08 0000 0000 4400 0072 0002 0f08 0000 0000 4400 0072 0002 0f20 0000 0000 4400 0073
1551360 0002 0f20 0000 0000 4400 0074 0002 0f38 0000 0000 4400 0075 0002 0f80 0005 651b 2400 0004 0002 0f90 0005 652a a000 0458
1551440 0000 0044 0005 6537 a000 0001 0000 0048 0000 0000 4400 007a 0002 0f90 0000 0000 4400 007a 0002 0fa4 0005 6540 8000 0001
1551520 ffff fffc 0005 654c 8000 0001 ffff fffb 0000 0000 c000 0002 0000 009c 0000 0000 4400 007e 0002 0fa4 0000 0000 4400 007f
1551600 0002 0fb0 0000 0000 4400 0080 0002 0fc8 0000 0000 4400 0081 0002 0fd4 0000 0000 4400 0082 0002 0fe8 0000 0000 4400 0083
1551660 0002 0ffc 0000 0000 4400 0084 0002 1014 0000 0000 4400 0085 0002 1028 0000 0000 4400 007f 0002 1030 0000 0000 e000 0002
1551740 0000 013c 0000 0000 4400 0087 0002 1044 0005 6555 2400 0004 0002 1054 0005 6564 a000 0001 0000 0044 0000 0000 4400 008b
1552020 0002 1054 0000 0000 4400 008b 0002 1064 0000 0000 4400 008c 0002 1064 0000 0000 4400 008d 0002 1078 0000 0000 4400 008e
1552100 0002 1084 0005 6570 2400 0004 0002 1094 0005 6585 a000 0458 0000 0044 0000 0000 4400 0092 0002 1094 0000 0000 4400 0092
1552160 0002 10a4 0005 6592 8000 0004 ffff fffc 0005 659a 8000 0002 ffff fff8 0000 0000 c000 0002 0000 019c 0000 0000 4400 0096
1552240 0002 10a4 0000 0000 4400 0097 0002 10bc 0000 0000 4400 0098 0002 10c8 0000 0000 4400 0099 0002 10e0 0000 0000 4400 0098
1552320 0002 10fc 0000 0000 e000 0002 0000 0208 0000 0000 4400 009a 0002 1110 0005 65a5 2400 0001 0002 1120 0005 65b6 a000 0004
1552400 0000 0044 0005 65c3 a000 0001 0000 0048 0005 65d3 a000 0004 0000 004c 0005 65e0 a000 0004 0000 0050 0005 65ee a000 0004
1552460 0000 0054 0005 65fb a000 0004 0000 0058 0005 6609 a000 0004 0000 005c 0000 0000 4400 00a2 0002 1120 0000 0000 4400 00a2
1552540 0002 1144 0005 6617 8000 0458 ffff fffc 0005 6623 8000 0004 ffff fff8 0005 662b 8000 0001 ffff fff4 0000 0000 c000 0002
1552620 0000 023c 0000 0000 4400 00a8 0002 1144 0000 0000 4400 00a9 0002 1158 0000 0000 4400 00aa 0002 1168 0000 0000 4400 00ab
1552700 0002 1170 0000 0000 4400 00ac 0002 1188 0000 0000 4400 00ad 0002 1198 0000 0000 4400 00ae 0002 11a0 0000 0000 4400 00af
1552760 0002 11ac 0000 0000 4400 00b0 0002 11b8 0000 0000 4400 00b1 0002 11c0 0000 0000 4400 00b2 0002 11c8 0000 0000 4400 00b3
1553040 0002 11d4 0000 0000 4400 00b4 0002 11dc 0000 0000 4400 00b5 0002 11e8 0000 0000 4400 00b6 0002 11f4 0000 0000 4400 00b7
1553120 0002 1200 0000 0000 4400 00b8 0002 120c 0000 0000 4400 00b9 0002 1218 0000 0000 4400 00ba 0002 1224 0000 0000 4400 00bb
1553200 0002 122c 0000 0000 4400 00bc 0002 1234 0000 0000 4400 00bd 0002 1244 0000 0000 4400 00be 0002 124c 0000 0000 4400 00bf
1553260 0002 1254 0000 0000 4400 00c0 0002 1264 0000 0000 4400 00c1 0002 126c 0000 0000 4400 00c2 0002 1290 0000 0000 4400 00c1
1553340 0002 12a4 0000 0000 4400 00c3 0002 12b8 0000 0000 4400 00c4 0002 12d4 0000 0000 4400 00c5 0002 12f0 0000 0000 4400 00c6
1553420 0002 130c 0000 0000 4400 00c7 0002 1328 0000 0000 4400 00c8 0002 1334 0000 0000 4400 00c9 0002 1350 0000 0000 4400 00ca
1553500 0002 136c 0000 0000 4400 00cb 0002 1388 0000 0000 4400 00cc 0002 13a4 0000 0000 4400 00cd 0002 13c0 0000 0000 4400 00ce
1553560 0002 13d0 0000 0000 4400 00cf 0002 13e0 0000 0000 e000 0002 0000 04e4 0000 0000 4400 00d0 0002 13ec 0005 6635 2400 0004
1553640 0002 13fc 0005 6646 a000 0001 0000 0044 0005 6653 a000 0004 0000 0048 0005 665f a000 0001 0000 004c 0000 0000 4400 00d6
1553720 0002 13fc 0000 0000 4400 00d6 0002 1414 0005 6668 8000 0458 ffff fffc 0005 6674 8000 0001 ffff fff8 0005 6680 8000 0001
1554000 ffff fff4 0000 0000 c000 0002 0000 050c 0000 0000 4400 00da 0002 1414 0000 0000 4400 00db 0002 1458 0000 0000 4400 00dc
1554060 0002 1464 0000 0000 4400 00dd 0002 147c 0000 0000 4400 00de 0002 14a4 0000 0000 4400 00df 0002 14b4 0000 0000 4400 00e0
1554140 0002 14d0 0000 0000 4400 00e1 0002 14e0 0000 0000 e000 0002 0000 05f8 0000 0000 4400 00e3 0002 1500 0005 668c 2400 0004
1554220 0002 1510 0005 66a2 a000 0001 0000 0044 0000 0000 4400 00e7 0002 1510 0000 0000 4400 00e7 0002 1520 0005 66af 8000 0458
1554300 ffff fffc 0000 0000 c000 0002 0000 0618 0000 0000 4400 00ea 0002 1520 0000 0000 4400 00eb 0002 1564 0000 0000 e000 0002
```

| | | | | | | | | | | | | | | | | | | | | | | | | |
|---|---|---|---|---|---|---|---|---|---|---|---|---|---|---|---|---|---|---|---|---|---|---|---|---|
| 1554360 | 0000 | 0668 | 0000 | 0000 | 4400 | 00ec | 0002 | 1570 | 0005 | 66bb | 2400 | 0004 | 0002 | 1580 | 0005 | 66cc | a000 | 0001 | 0000 | 0044 | 0000 | 0000 | 4400 | 00f0 |
| 1554440 | 0002 | 1580 | 0000 | 0000 | 4400 | 00f0 | 0002 | 1590 | 0005 | 66d9 | 8000 | 0458 | ffff | fffc | 0000 | 0000 | c000 | 0002 | 0000 | 0688 | 0000 | 0000 | 4400 | 00f3 |
| 1554520 | 0002 | 1590 | 0000 | 0000 | 4400 | 00f4 | 0002 | 15d4 | 0000 | 0000 | e000 | 0002 | 0000 | 06d4 | 0000 | 0000 | 4400 | 00f5 | 0002 | 151c | 0005 | 66e5 | 2400 | 0004 |
| 1554600 | 0002 | 15ec | 0005 | 66f5 | a000 | 0001 | 0000 | 0044 | 0000 | 0000 | 4400 | 00f9 | 0002 | 15ec | 0000 | 0000 | 4400 | 00f9 | 0002 | 15fc | 0005 | 6702 | 8000 | 0458 |
| 1554660 | ffff | fffc | 0000 | 0000 | c000 | 0002 | 0000 | 06f4 | 0000 | 0000 | 4400 | 00fc | 0002 | 15fc | 0000 | 0000 | 4400 | 00fd | 0002 | 1640 | 0000 | 0000 | 4400 | 00fe |
| 1554740 | 0002 | 164c | 0000 | 0000 | e000 | 0002 | 0000 | 0750 | 0000 | 0000 | 4400 | 00ff | 0002 | 1658 | 0005 | 670e | 2400 | 0004 | 0002 | 1668 | 0005 | 6721 | a000 | 0001 |
| 1555020 | 0000 | 0044 | 0005 | 672e | a000 | 0004 | 0000 | 0048 | 0000 | 0000 | 4400 | 0104 | 0002 | 1668 | 0000 | 0000 | 4400 | 0104 | 0002 | 167c | 0005 | 673c | 8000 | 0458 |
| 1555100 | ffff | fffc | 0000 | 0000 | c000 | 0002 | 0000 | 0774 | 0000 | 0000 | 4400 | 0107 | 0002 | 167c | 0000 | 0000 | 4400 | 0108 | 0002 | 16c0 | 0000 | 0000 | e000 | 0002 |
| 1555160 | 0000 | 07c4 | 0000 | 0000 | 4400 | 0109 | 0002 | 16cc | 0005 | 6748 | 2400 | 0004 | 0002 | 16dc | 0005 | 675a | a000 | 0001 | 0000 | 0044 | 0005 | 6767 | a000 | 0004 |
| 1555240 | 0000 | 0048 | 0000 | 0000 | 4400 | 010e | 0002 | 16dc | 0000 | 0000 | 4400 | 010e | 0002 | 16f0 | 0005 | 6775 | 8000 | 0458 | ffff | fffc | 0000 | 0000 | c000 | 0002 |
| 1555320 | 0000 | 07e8 | 0000 | 0000 | 4400 | 0111 | 0002 | 16f0 | 0000 | 0000 | 4400 | 0112 | 0002 | 1734 | 0000 | 0000 | e000 | 0002 | 0000 | 0838 | 0000 | 0C00 | 4400 | 0113 |
| 1555400 | 0002 | 1740 | 0005 | 6781 | 2400 | 0004 | 0002 | 1750 | 0005 | 6791 | a000 | 0001 | 0000 | 0044 | 0005 | 679e | a000 | 0001 | 0000 | 0048 | 0005 | 67aa | a000 | 0004 |
| 1555460 | 0000 | 004c | 0000 | 0000 | 4400 | 0119 | 0002 | 1750 | 0000 | 0000 | 4400 | 0119 | 0002 | 1768 | 0005 | 67b5 | 8000 | 0458 | ffff | fffc | 0005 | 67c1 | 8000 | 0001 |
| 1555540 | ffff | fffb | 0000 | 0000 | c000 | 0002 | 0000 | 0860 | 0000 | 0000 | 4400 | 011d | 0002 | 1769 | 0000 | 0000 | 4400 | 011e | 0002 | 17ac | 0000 | 0000 | 4400 | 011f |
| 1555620 | 0002 | 17b8 | 0000 | 0000 | 4400 | 0120 | 0002 | 17d4 | 0000 | 0000 | 4400 | 0121 | 0002 | 17e8 | 0000 | 0000 | 4400 | 0122 | 0002 | 17f4 | 0000 | 0000 | e000 | 0002 |
| 1555700 | 0000 | 090c | 0000 | 0000 | 4400 | 0123 | 0002 | 1814 | 0005 | 67ca | 2400 | 0004 | 0002 | 1824 | 0005 | 67da | a000 | 0001 | 0000 | 0044 | 0005 | 67e7 | a000 | 0001 |
| 1555760 | 0000 | 0048 | 0005 | 67f3 | a000 | 0004 | 0000 | 004c | 0000 | 0000 | 4400 | 0129 | 0002 | 1824 | 0000 | 0000 | 4400 | 0129 | 0002 | 183c | 0005 | 67fe | 8000 | 0458 |
| 1556040 | ffff | fffc | 0005 | 680a | 8000 | 0001 | ffff | fff8 | 0005 | 6816 | 8000 | 0001 | ffff | fff4 | 0005 | 6823 | 8000 | 0001 | ffff | fff0 | 0005 | 682e | 8000 | 0004 |
| 1556120 | ffff | ffec | 0005 | 683b | 8000 | 0004 | ffff | ffe8 | 0005 | 6847 | 8000 | 0004 | ffff | ffe4 | 0000 | 0000 | c000 | 0002 | 0000 | 0934 | 0000 | 0000 | 4400 | 012e |
| 1556200 | 0002 | 183c | 0000 | 0000 | 4400 | 012f | 0002 | 1880 | 0000 | 0000 | 4400 | 0130 | 0002 | 18b0 | 0000 | 0000 | 4400 | 0131 | 0002 | 18c8 | 0000 | 0000 | 4400 | 0133 |
| 1556260 | 0002 | 18d4 | 0000 | 0000 | 4400 | 0134 | 0002 | 18e8 | 0000 | 0000 | 4400 | 0135 | 0002 | 18f8 | 0000 | 0000 | 4400 | 0136 | 0002 | 1900 | 0000 | 0000 | 4400 | 0137 |
| 1556340 | 0002 | 190c | 0000 | 0000 | 4400 | 0138 | 0002 | 1924 | 0000 | 0000 | 4400 | 0139 | 0002 | 1928 | 0000 | 0000 | 4400 | 013a | 0002 | 1938 | 0000 | 0000 | 4400 | 013c |
| 1556420 | 0002 | 194c | 0000 | 0000 | 4400 | 013d | 0002 | 195c | 0000 | 0000 | 4400 | 013e | 0002 | 196c | 0000 | 0000 | 4400 | 013f | 0002 | 1980 | 0000 | 0000 | 4400 | 0140 |
| 1556500 | 0002 | 19a8 | 0000 | 0000 | 4400 | 0141 | 0002 | 19d0 | 0000 | 0000 | 4400 | 0142 | 0002 | 19e8 | 0000 | 0000 | 4400 | 0145 | 0002 | 1a0c | 0000 | 0000 | 4400 | 0146 |
| 1556560 | 0002 | 1a20 | 0000 | 0000 | 4400 | 0147 | 0002 | 1a2c | 0000 | 0000 | 4400 | 0148 | 0002 | 1a44 | 0000 | 0000 | 4400 | 0149 | 0002 | 1a54 | 0000 | 0000 | 4400 | 014b |
| 1556640 | 0002 | 1a70 | 0000 | 0000 | 4400 | 014c | 0002 | 1a80 | 0000 | 0000 | 4400 | 014d | 0002 | 1aa0 | 0000 | 0000 | 4400 | 014e | 0002 | 1ac8 | 0000 | 0000 | 4400 | 014f |
| 1556720 | 0002 | 1ae4 | 0000 | 0000 | 4400 | 0150 | 0002 | 1afc | 0000 | 0000 | 4400 | 0151 | 0002 | 1b10 | 0000 | 0000 | 4400 | 0153 | 0002 | 1b1c | 0000 | 0000 | 4400 | 014c |
| 1557000 | 0002 | 1b38 | 0000 | 0000 | 4400 | 0156 | 0002 | 1b40 | 0000 | 0000 | 4400 | 0157 | 0002 | 1b58 | 0000 | 0000 | e000 | 0002 | 0000 | 0c5c | 0000 | 0000 | 4400 | 0159 |
| 1557060 | 0002 | 1b64 | 0005 | 6855 | 2400 | 0004 | 0002 | 1b74 | 0005 | 6866 | a000 | 0001 | 0000 | 0044 | 0005 | 6873 | a000 | 0001 | 0000 | 0048 | 0005 | 6888 | a000 | 0004 |
| 1557140 | 0000 | 004c | 0000 | 0000 | 4400 | 015f | 0002 | 1b74 | 0000 | 0000 | 4400 | 015f | 0002 | 1b8c | 0005 | 6893 | 8000 | 0458 | ffff | fffc | 0005 | 689f | 8000 | 0001 |
| 1557220 | ffff | fff8 | 0000 | 0000 | c000 | 0002 | 0000 | 0c84 | 0000 | 0000 | 4400 | 0163 | 0002 | 1b8c | 0000 | 0000 | 4400 | 0164 | 0002 | 1bd0 | 0000 | 0000 | 4400 | 0165 |
| 1557300 | 0002 | 1bdc | 0000 | 0000 | 4400 | 0166 | 0002 | 1bf0 | 0000 | 0000 | 4400 | 0167 | 0002 | 1c08 | 0000 | 0000 | 4400 | 0168 | 0002 | 1c20 | 0000 | 0000 | 4400 | 0169 |
| 1557360 | 0002 | 1c2c | 0000 | 0000 | 4400 | 016b | 0002 | 1c38 | 0000 | 0000 | 4400 | 016c | 0002 | 1c44 | 0000 | 0000 | e000 | 0002 | 0000 | 0d58 | 0000 | 0000 | 4400 | 016e |
| 1557440 | 0002 | 1c60 | 0005 | 68aa | 2400 | 0004 | 0002 | 1c70 | 0005 | 68bc | a000 | 0001 | 0000 | 0044 | 0005 | 68c9 | a000 | 0001 | 0000 | 0048 | 0000 | 0000 | 4400 | 0173 |
| 1557520 | 0002 | 1c70 | 0000 | 0000 | 4400 | 0173 | 0002 | 1c84 | 0005 | 68d5 | 8000 | 0458 | ffff | fffc | 0005 | 68e1 | 8000 | 0004 | ffff | fff8 | 0000 | 0000 | c000 | 0002 |
| 1557600 | 0000 | 0d7c | 0000 | 0000 | 4400 | 0177 | 0002 | 1c94 | 0000 | 0000 | 4400 | 0178 | 0002 | 1cc8 | 0000 | 0000 | 4400 | 0179 | 0002 | 1d10 | 0000 | 0000 | 4400 | 017a |
| 1557660 | 0002 | 1d24 | 0000 | 0000 | 4400 | 017b | 0002 | 1d34 | 0000 | 0000 | 4400 | 017d | 0002 | 1d5c | 0000 | 0000 | 4400 | 017e | 0002 | 1d98 | 0000 | 0000 | 4400 | 017f |
| 1557740 | 0002 | 1da8 | 0000 | 0000 | e000 | 0002 | 0000 | 0eac | 0000 | 0000 | 4400 | 0180 | 0002 | 1db4 | 0005 | 68eb | 2400 | 0004 | 0002 | 1dc4 | 0005 | 68fa | a000 | 0001 |
| 1560020 | 0000 | 0044 | 0005 | 6907 | a000 | 0004 | 0000 | 0048 | 0005 | 6915 | a000 | 0001 | 0000 | 004c | 0000 | 0000 | 4400 | 0186 | 0002 | 1dc4 | 0000 | 0000 | 4400 | 0186 |
| 1560100 | 0002 | 1ddc | 0005 | 6923 | 8000 | 0458 | ffff | fffc | 0000 | 0000 | c000 | 0002 | 0000 | 0ed4 | 0000 | 0000 | 4400 | 0189 | 0002 | 1ddc | 0000 | 0000 | 4400 | 018a |
| 1560160 | 0002 | 1e20 | 0000 | 0000 | 4400 | 018b | 0002 | 1e28 | 0000 | 0000 | 4400 | 018c | 0002 | 1e34 | 0000 | 0000 | 4400 | 018d | 0002 | 1e40 | 0000 | 0000 | e000 | 0002 |
| 1560240 | 0000 | 0f40 | 0000 | 0000 | 4400 | 018e | 0002 | 1e48 | 0005 | 692f | 2400 | 0004 | 0002 | 1e58 | 0005 | 693f | a000 | 0458 | 0000 | 0044 | 0000 | 0000 | 4400 | 0192 |
| 1560320 | 0002 | 1e58 | 0000 | 0000 | 4400 | 0192 | 0002 | 1e68 | 0000 | 0000 | 4400 | 0193 | 0002 | 1e68 | 0000 | 0000 | 4400 | 0194 | 0002 | 1e7c | 0000 | 0000 | 4400 | 0195 |
| 1560400 | 0002 | 1ea4 | 0005 | 694c | 2400 | 0004 | 0002 | 1eb4 | 0005 | 6960 | a000 | 0458 | 0000 | 0044 | 0000 | 0000 | 4400 | 0199 | 0002 | 1eb4 | 0000 | 0000 | 4400 | 0199 |
| 1560460 | 0002 | 1ec4 | 0000 | 0000 | 4400 | 019a | 0002 | 1ec4 | 0000 | 0000 | 4400 | 019b | 0002 | 1ed8 | 0000 | 0000 | 4400 | 019c | 0002 | 1ee4 | 0000 | 0000 | 4400 | 019d |
| 1560540 | 0002 | 1f08 | 0000 | 0000 | 4400 | 019e | 0002 | 1f18 | 0000 | 0000 | 4400 | 019f | 0002 | 1f40 | 0000 | 0000 | 4400 | 01a0 | 0002 | 1f5c | 0000 | 0000 | 4400 | 01a1 |
| 1560620 | 0002 | 1f80 | 0000 | 0000 | 4400 | 01a2 | 0002 | 1f88 | 0000 | 0000 | 4400 | 01a3 | 0002 | 1f94 | 0000 | 0000 | 4400 | 01a4 | 0002 | 1fa0 | 0005 | 696d | 2400 | 0004 |
| 1560700 | 0002 | 1fb0 | 0005 | 697e | a000 | 0458 | 0000 | 0044 | 0000 | 0000 | 4400 | 01a8 | 0002 | 1fb0 | 0000 | 0000 | 4400 | 01a8 | 0002 | 1fc0 | 0000 | 0000 | 4400 | 01a9 |
| 1560760 | 0002 | 1fc0 | 0000 | 0000 | 4400 | 01aa | 0002 | 2014 | 0005 | 698b | 2400 | 0004 | 0002 | 2024 | 0005 | 699b | a000 | 0458 | 0000 | 0044 | 0005 | 69a8 | a000 | 0004 |
| 1561040 | 0000 | 0048 | 0000 | 0000 | 4400 | 01af | 0002 | 2024 | 0000 | 0000 | 4400 | 01af | 0002 | 2038 | 0000 | 0000 | 4400 | 01b0 | 0002 | 2038 | 0000 | 0000 | 4400 | 01b1 |
| 1561120 | 0002 | 2048 | 0000 | 0000 | 4400 | 01b2 | 0002 | 2050 | 0000 | 0000 | 4400 | 01b3 | 0002 | 2060 | 0000 | 0000 | 4400 | 01b4 | 0002 | 2078 | 0005 | 69b2 | 2400 | 0004 |
| 1561200 | 0002 | 2088 | 0005 | 69c3 | a000 | 0458 | 0000 | 0044 | 0005 | 69d0 | a000 | 0004 | 0000 | 0048 | 0000 | 0000 | 4400 | 01b9 | 0002 | 2088 | 0000 | 0000 | 4400 | 01b9 |
| 1561260 | 0002 | 209c | 0005 | 69dc | 8000 | 0004 | ffff | fffc | 0005 | 69ea | 8000 | 0004 | ffff | fff8 | 0005 | 69f2 | 8000 | 0001 | ffff | fff4 | 0005 | 69fc | 8000 | 0001 |
| 1561340 | ffff | fff0 | 0000 | 0000 | c000 | 0002 | 0000 | 1194 | 0000 | 0000 | 4400 | 01bd | 0002 | 209c | 0000 | 0000 | 4400 | 01be | 0002 | 20a8 | 0000 | 0000 | 4400 | 01bf |
| 1561420 | 0002 | 20c0 | 0000 | 0000 | 4400 | 01c0 | 0002 | 20e4 | 0000 | 0000 | 4400 | 01c1 | 0002 | 20f0 | 0000 | 0000 | 4400 | 01c2 | 0002 | 211c | 0000 | 0000 | 4400 | 01c3 |

```
1561500 0002 2128 0000 0000 4400 01c4 0002 2134 0000 0000 4400 01c5 0002 2154 0000 0000 4400 01c6 0002 2160 0000 0000 4400 01c7
1561560 0002 217c 0000 0000 4400 01c6 0002 21a4 0000 0000 4400 01ca 0002 21b8 0000 0000 4400 01cb 0002 21e8 0000 0000 4400 01cc
1561640 0002 21f8 0000 0000 4400 01cd 0002 2204 0000 0000 4400 01cf 0002 2210 0000 0000 4400 01d1 0002 222c 0000 0000 e000 0002
1561720 0000 1340 0000 0000 4400 01d2 0002 2248 0005 6a07 2400 0004 0002 2258 0005 6a1a a000 0458 0000 0044 0000 0000 4400 01d6
1562000 0002 2258 0000 0000 4400 01d6 0002 2268 0005 6a27 8000 0004 ffff fffc 0005 6a2f 8000 0004 ffff fff8 0005 6a3b 8000 0004
1562060 ffff fff4 0005 6a47 8000 0004 ffff fff0 0000 0000 c000 0002 0000 1360 0000 0000 4400 01d9 0002 2268 0000 0000 4400 01da
1562140 0002 2278 0000 0000 4400 01db 0002 227c 0000 0000 4400 01dc 0002 2284 0000 0000 4400 01dd 0002 2284 0000 0000 4400 01de
1562220 0002 22d4 0000 0000 4400 01df 0002 22e4 0000 0000 4400 01e0 0002 22f4 0000 0000 4400 01e1 0002 2308 0000 0000 4400 01e2
1562300 0002 2318 0000 0000 4400 01e3 0002 2328 0000 0000 4400 01e4 0002 233c 0000 0000 4400 01e6 0002 2350 0000 0000 4400 01e7
1562360 0002 235c 0000 0000 4400 01e8 0002 236c 0000 0000 4400 01e9 0002 236c 0000 0000 4400 01ea 0002 2388 0000 0000 4400 01ec
1562440 0002 2390 0000 0000 4400 01ee 0002 23ac 0000 0000 4400 01ef 0002 23b4 0000 0000 e000 0002 0000 14bc 0000 0000 4400 01f0
1562520 0002 23c4 0005 6a53 2400 0004 0002 23d4 0005 6a64 a000 0458 0000 0044 0000 0000 4400 01f4 0002 23d4 0000 0000 4400 01f4
1562600 0002 23e4 0005 6a71 8000 0004 ffff fffc 0005 6a79 8000 0004 ffff fff8 0005 6a83 8000 0004 ffff fff4 0000 0000 c000 0002
1562660 0000 14dc 0000 0000 4400 01f7 0002 23e4 0000 0000 4400 01f8 0002 23f8 0000 0000 4400 01f9 0002 2404 0000 0000 4400 01fa
1562740 0002 2404 0000 0000 4400 01fb 0002 2414 0000 0000 4400 01fc 0002 2424 0000 0000 4400 01fd 0002 242c 0000 0000 4400 01ff
1563020 0002 2434 0000 0000 4400 0200 0002 2440 0000 0000 4400 0201 0002 2448 0000 0000 4400 0204 0002 2450 0000 0000 4400 0205
1563100 0002 2458 0000 0000 4400 0208 0002 2460 0000 0000 4400 0209 0002 246d 0000 0000 4400 020c 0002 2470 0000 0000 4400 020d
1563160 0002 2478 0000 0000 4400 0210 0002 2480 0000 0000 4400 0211 0002 2488 0000 0000 4400 0214 0002 2490 0000 0000 4400 0215
1563240 0002 2498 0000 0000 4400 0218 0002 24a0 0000 0000 4400 0219 0002 24a8 0000 0000 4400 021a 0002 24ac 0000 0000 4400 021b
1563320 0002 24ac 0000 0000 4400 021c 0002 24c4 0000 0000 4400 021d 0002 24d4 0000 0000 4400 021e 0002 250c 0000 0000 4400 021f
1563400 0002 251c 0000 0000 4400 01fd 0002 2524 0000 0000 4400 0221 0002 26b0 0000 0000 e000 0002 0000 17b4 0000 0000 4400 0222
1563460 0002 26bc 0005 6a9c 2400 0004 0002 26cc 0005 6aa1 a000 0458 0000 0044 0005 6aae a000 0001 0000 0048 0000 0000 4400 0227
1563540 0002 26cc 0000 0000 4400 0227 0002 26e0 0005 6abe 8000 0004 ffff fffc 0005 6ac6 8000 0004 ffff fff8 0005 6ad3 8000 0001
1563620 ffff fff4 0000 0000 c000 0002 0000 17d8 0000 0000 4400 022b 0002 26e0 0000 0000 4400 022c 0002 26e8 0000 0000 4400 022d
1563700 0002 26f0 0000 0000 4400 022e 0002 26f0 0000 0000 4400 022f 0002 2740 0000 0000 4400 0230 0002 2758 0000 0000 4400 0231
1563760 0002 2760 0000 0000 4400 0232 0002 2780 0000 0000 4400 0233 0002 2780 0000 0000 4400 0234 0002 27a4 0000 0000 4400 0235
1564040 0002 27c0 0000 0000 4400 0237 0002 27c8 0000 0000 4400 0238 0002 27e0 0000 0000 4400 0239 0002 27f0 0000 0000 4400 023a
1564120 0002 27fc 0000 0000 4400 023b 0002 280c 0000 0000 4400 023c 0002 281c 0000 0000 4400 023e 0002 2830 0000 0000 4400 0240
1564200 0002 2848 0000 0000 4400 0241 0002 2860 0000 0000 4400 0242 0002 2870 0000 0000 4400 0243 0002 2834 0000 0000 4400 0244
1564260 0002 28a8 0000 0000 e000 0002 0000 19b0 0000 0000 4400 0245 0002 28b8 0005 6ada 2400 0004 0002 28c8 0005 6aea a000 0001
1564340 0000 0044 0000 0000 4400 0249 0002 28c8 0000 0000 4400 0249 0002 28d8 0005 6af7 8000 0458 ffff fffc 0000 0000 c000 0002
1564420 0000 19d0 0000 0000 4400 024c 0002 28d8 0000 0000 4400 024e 0002 291c 0000 0000 e000 0002 0000 1a48 0000 0000 4400 024f
1564500 0002 2950 0005 6b03 2400 0004 0002 2960 0005 6b12 a000 0001 0000 0044 0000 0000 4400 0253 0002 2960 0000 0000 4400 0253
1564560 0002 2970 0005 6b1f 8000 0458 ffff fffc 0000 0000 c000 0002 0000 1a68 0000 0000 4400 0256 0002 2970 0000 0000 4400 0257
1564640 0002 29b4 0000 0000 e000 0002 0000 1ad4 0000 0000 4400 0258 0002 29dc 0005 6b2b 2400 0004 0002 29ec 0005 6b3d a000 0001
1564720 0000 0044 0005 6b4a a000 0004 0000 0048 0000 0000 4400 025d 0002 29ec 0000 0000 4400 025d 0002 2a00 0005 6b57 8000 0458
1565000 ffff fffc 0000 0000 c000 0002 0000 1af8 0000 0000 4400 0260 0002 2a00 0000 0000 4400 0261 0002 2a44 0000 0000 4400 0262
1565060 0002 2a50 0000 0000 e000 0002 0000 1b54 0000 0000 4400 0263 0002 2a5c 0005 6b63 2400 0004 0002 2a6c 0005 6b72 a000 0001
1565140 0000 0044 0005 6b7e a000 0001 0000 0048 0005 6b8e a000 0004 0000 004c 0005 6b9e a000 0001 0000 0050 0000 0000 4400 0269
1565220 0002 2a6c 0000 0000 4400 0269 0002 2a88 0005 6bab 8000 0004 ffff fffc 0005 6bb3 8000 0001 ffff fff8 0005 6bbd 8000 0001
1565300 ffff fff4 0005 6bc9 8000 0004 ffff fff0 0005 6bd7 8000 0458 ffff ffec 0000 0000 c000 0002 0000 1b80 0000 0000 4400 026f
1565360 0002 2a88 0000 0000 4400 0270 0002 2acc 0000 0000 4400 0271 0002 2ad8 0000 0000 4400 0272 0002 2b10 0000 0000 4400 0273
1565440 0002 2b34 0000 0000 4400 0274 0002 2b4c 0000 0000 4400 0275 0002 2b54 0000 0000 4400 0276 0002 2b6c 0000 0000 4400 0277
1565520 0002 2ba8 0000 0000 4400 0278 0002 2bb0 0000 0000 4400 0279 0002 2bbc 0000 0000 4400 027a 0002 2bc8 0000 0000 4400 027b
1565600 0002 2bc8 0000 0000 4400 027c 0002 2c18 0000 0000 4400 027d 0002 2c34 0000 0000 4400 027e 0002 2c40 0000 0000 4400 0280
1565660 0002 2c48 0000 0000 4400 0281 0002 2c64 0000 0000 4400 0282 0002 2c7c 0000 0000 4400 0283 0002 2c94 0000 0000 4400 0284
1565740 0002 2ca8 0000 0000 4400 0285 0002 2cb8 0000 0000 4400 0287 0002 2cd0 0000 0000 4400 0288 0002 2ce8 0000 0000 4400 028b
1566020 0002 2304 0000 0000 4400 028c 0002 2d18 0000 0000 4400 028d 0002 2d28 0000 0000 4400 028e 0002 2d40 0000 0000 4400 028f
1566100 0002 2d60 0000 0000 4400 028e 0002 2d94 0000 0000 4400 0290 0002 2d9c 0000 0000 e000 0002 0000 1ea0 0000 0000 4400 0291
1566160 0002 2da8 0005 6be3 2400 0001 0002 2db8 0005 6bf2 a000 0001 0000 0044 0005 6bff a000 0001 0000 0048 0005 6c0f a000 0004
1566240 0000 004c 0000 0000 4400 0297 0002 2db8 0000 0000 4400 0297 0002 2dd0 0005 6c1c 8000 0001 ffff fffc 0005 6c27 8000 0001
1566320 ffff fff8 0005 6c32 8000 0001 ffff fff4 0005 6c3d 8000 0001 ffff fff0 0005 6c47 8000 0001 ffff ffec 0005 6c53 8000 0004
1566400 ffff ffe8 0005 6c5e 8000 0004 ffff ffe4 0005 6c6a 8000 0458 ffff ffe0 0000 0000 c000 0002 0000 1ec8 0000 0000 4400 029e
1566460 0002 2dd0 0000 0000 4400 029f 0002 2e14 0000 0000 4400 02a0 0002 2e1c 0000 0000 4400 02a1 0002 2e28 0000 0000 4400 02a2
1566540 0002 2e2c 0000 0000 4400 02a3 0002 2e2c 0000 0000 4400 02a4 0002 2e58 0000 0000 4400 02a5 0002 2e6c 0000 0000 4400 02a6
```

```
1566620  0002 2e74 0000 0000 4400 02a7 0002 2e84 0000 0000 4400 02a8 0002 2e98 0000 0000 4400 02a9 0002 2eb4 0000 0000 4400 02ab
1566700  0002 2ec0 0000 0000 4400 02ac 0002 2ecc 0000 0000 4400 02ae 0002 2ed4 0000 0000 4400 02af 0002 2edc 0000 0000 4400 02b0
1566760  0002 2eec 0000 0000 4400 02b1 0002 2ef8 0000 0000 4400 02b2 0002 2f00 0000 0000 4400 02b3 0002 2f10 0000 0000 4400 02b4
1567040  0002 2f28 0000 0000 4400 02b5 0002 2f30 0000 0000 4400 02b6 0002 2f30 0000 0000 4400 02b7 0002 2f38 0000 0000 4400 02b8
1567120  0002 2f4c 0000 0000 4400 02b9 0002 2f54 0000 0000 4400 02ba 0002 2f64 0000 0000 4400 02bb 0002 2f70 0000 0000 4400 02bc
1567200  0002 2f88 0000 0000 4400 02bd 0002 2fb8 0000 0000 4400 02be 0002 2fc4 0000 0000 4400 02bf 0002 2fd4 0000 0000 4400 02c0
1567260  0002 2fdc 0000 0000 4400 02c1 0002 2fe4 0000 0000 e000 0002 0000 20e8 0000 0000 4400 02c2 0002 2ff0 0005 6c76 2400 0004
1567340  0002 3000 0005 6c94 a000 0001 0000 0044 0000 0000 4400 02c6 0002 3000 0000 0000 4400 02c6 0002 3010 0005 6c91 8000 0004
1567420  ffff fffc 0005 6c99 8000 0004 ffff fff8 0005 6ca5 8000 0004 ffff fff4 0005 6cad 8000 0004 ffff fff0 0005 6cb6 8000 0004
1567500  ffff ffec 0005 6cc2 8000 0001 ffff ffe8 0005 6ccc 8000 0001 ffff ffe4 0005 6cd6 8000 0001 ffff ffe0 0005 6ce3 8000 0458
1567560  ffff ffdc 0000 0000 c000 0002 0000 2108 0000 0000 4400 02cb 0002 3010 0000 0000 4400 02cc 0002 3054 0000 0000 4400 02cd
1567640  0002 305c 0000 0000 4400 02ce 0002 3068 0000 0000 4400 02cf 0002 3068 0000 0000 4400 02d0 0002 3070 0000 0000 4400 02d1
1567720  0002 30c0 0000 0000 4400 02d2 0002 30d4 0000 0000 4400 02d3 0002 30e4 0000 0000 4400 02d4 0002 30f4 0000 0000 4400 02d5
1570000  0002 3108 0000 0000 4400 02d6 0002 3118 0000 0000 4400 02d7 0002 3134 0000 0000 4400 02d8 0002 3140 0000 0000 4400 02db
1570060  0002 3150 0000 0000 4400 02dc 0002 3178 0000 0000 4400 02df 0002 3180 0000 0000 4400 02e1 0002 3188 0000 0000 4400 02e2
1570140  0002 3190 0000 0000 4400 02e3 0002 3190 0000 0000 4400 02e4 0002 31a8 0000 0000 4400 02e5 0002 31f8 0000 0000 4400 02e6
1570220  0002 3210 0000 0000 4400 02e7 0002 322c 0000 0000 4400 02e8 0002 3244 0000 0000 4400 02e9 0002 3260 0000 0000 4400 02ea
1570300  0002 3270 0000 0000 4400 02eb 0002 3280 0000 0000 4400 02ec 0002 3288 0000 0000 4400 02ed 0002 329c 0000 0000 4400 02ef
1570360  0002 32a8 0000 0000 4400 02f0 0002 32ec 0000 0000 4400 02f1 0002 32fc 0000 0000 4400 02f3 0002 3304 0000 0000 4400 02f4
1570440  0002 3314 0000 0000 4400 02f5 0002 331c 0000 0000 4400 02f6 0002 331c 0000 0000 4400 02f7 0002 3334 0000 0000 4400 02f8
1570520  0002 3344 0000 0000 4400 02f9 0002 3354 0000 0000 4400 02fa 0002 33a4 0000 0000 4400 02fb 0002 33b8 0000 0000 4400 02fc
1570600  0002 33d0 0000 0000 4400 02fd 0002 33d0 0000 0000 4400 02fe 0002 33f4 0000 0000 4400 0300 0002 33fc 0000 0000 4400 0301
1570660  0002 340c 0000 0000 4400 0302 0002 3414 0000 0000 4400 0303 0002 3424 0000 0000 4400 0304 0002 342c 0000 0000 4400 0305
1570740  0002 3458 0000 0000 4400 0308 0002 3460 0000 0000 4400 0309 0002 34d8 0000 0000 4400 030a 0002 34e0 0000 0000 4400 030b
1571020  0002 34e8 0000 0000 4400 030c 0002 34f8 0000 0000 4400 030d 0002 3514 0000 0000 4400 030e 0002 351c 0000 0000 4400 0310
1571100  0002 3528 0000 0000 4400 0312 0002 3530 0000 0000 4400 0313 0002 3534 0000 0000 4400 0314 0002 3534 0000 0000 4400 0315
1571160  0002 354c 0000 0000 4400 0316 0002 356c 0000 0000 4400 0317 0002 3574 0000 0000 4400 0318 0002 3588 0000 0000 4400 0319
1571240  0002 359c 0000 0000 4400 031a 0002 35b0 0000 0000 4400 031b 0002 35b8 0000 0000 4400 031c 0002 35c8 0000 0000 4400 031d
1571320  0002 35e0 0000 0000 4400 031e 0002 35f0 0000 0000 4400 031f 0002 3600 0000 0000 4400 0320 0002 3610 0000 0000 4400 0322
1571400  0002 3620 0000 0000 4400 0323 0002 3654 0000 0000 4400 0326 0002 365c 0000 0000 4400 0327 0002 3664 0000 0000 4400 0328
1571460  0002 366c 0000 0000 4400 0329 0002 36a4 0000 0000 4400 032a 0002 36b0 0000 0000 4400 032c 0002 36c8 0000 0000 4400 032d
1571540  0002 36d8 0000 0000 4400 032e 0002 36ec 0000 0000 4400 0330 0002 3704 0000 0000 4400 0332 0002 372c 0000 0000 4400 0333
1571620  0002 3744 0000 0000 4400 0334 0002 3758 0000 0000 4400 0336 0002 3760 0000 0000 4400 0338 0002 3768 0000 0000 4400 0339
1571700  0002 3784 0000 0000 4400 033a 0002 37a0 0000 0000 4400 033c 0002 37a8 0000 0000 4400 033d 0002 37b8 0000 0000 4400 033f
1571760  0002 37c0 0000 0000 4400 0340 0002 37d8 0000 0000 4400 0341 0002 37ec 0000 0000 4400 0343 0002 3804 0000 0000 4400 0344
1572040  0002 3820 0000 0000 4400 02df 0002 3828 0000 0000 4400 0346 0002 386c 0000 0000 4400 0347 0002 3874 0000 0000 4400 0348
1572120  0002 388c 0000 0000 4400 0349 0002 3898 0000 0000 4400 034a 0002 38c4 0000 0000 4400 034b 0002 38ec 0000 0000 4400 034c
1572200  0002 3904 0000 0000 4400 034e 0002 3918 0000 0000 4400 0350 0002 393c 0000 0000 e000 0002 0000 2a3c 0000 0000 4400 0351
1572260  0002 3944 0005 6cef 2400 0004 0002 3954 0005 6cff a000 0001 0000 0044 0005 6d0b a000 0001 0000 0048 0000 0000 4400 0357
1572340  0002 3954 0000 0000 4400 0357 0002 3968 0005 6d17 8000 0014 ffff fffc 0005 6d28 8000 0004 ffff fff8 0005 6d30 8000 0004
1572420  ffff fff4 0000 0000 c000 0002 0000 2a50 0000 0000 4400 035b 0002 3968 0000 0000 4400 035c 0002 3974 0000 0000 4400 035d
1572500  0002 397c 0000 0000 4400 035e 0002 397c 0000 0000 4400 035f 0002 39d0 0000 0000 4400 0360 0002 39e0 0000 0000 4400 0361
1572560  0002 39e8 0000 0000 4400 0362 0002 3a00 0000 0000 4400 0363 0002 3a0c 0000 0000 4400 0364 0002 3a1c 0000 0000 e000 0002
1572640  0000 2b28 0000 0000 4400 0365 0002 3a30 0005 6d38 2400 0004 0002 3a40 0005 6d4c a000 0001 0000 0044 0005 6d58 a000 0001
1572720  0000 0048 0000 0000 4400 0369 0002 3a40 0000 0000 4400 0369 0002 3a54 0005 6d66 8000 0004 ffff fffc 0005 6d6e 8000 0004
1573000  ffff fff8 0000 0000 c000 0002 0000 2b4c 0000 0000 4400 036c 0002 3a54 0000 0000 4400 036d 0002 3a5c 0000 0000 4400 036e
1573060  0002 3a5c 0000 0000 4400 036f 0002 3abc 0000 0000 4400 0370 0002 3acc 0000 0000 4400 0371 0002 3ad4 0000 0000 4400 0372
1573140  0002 3aec 0000 0000 4400 0373 0002 3af8 0000 0000 4400 0374 0002 3b08 0000 0000 4400 0375 0002 3b10 0000 0000 4400 0376
1573220  0002 3b20 0000 0000 e000 0002 0000 2c2c 0000 0000 4400 0377 0002 3b34 0005 6d76 2400 0004 0002 3b44 0005 6d88 a000 0001
1573300  0000 0044 0005 6d94 a000 0001 0000 0048 0000 0000 4400 037b 0002 3b44 0000 0000 4400 037b 0002 3b58 0005 6da1 8000 0001
1573360  ffff fffc 0005 6da9 8000 0004 ffff fff8 0000 0000 c000 0002 0000 2c50 0000 0000 4400 037f 0002 3b58 0000 0000 4400 0380
1573440  0002 3b64 0000 0000 4400 0381 0002 3b6c 0000 0000 4400 0382 0002 3b6c 0000 0000 4400 0383 0002 3b84 0000 0000 4400 0384
1573520  0002 3b8c 0000 0000 4400 0385 0002 3bb4 0000 0000 4400 0386 0002 3bcc 0000 0000 4400 0387 0002 3bd8 0000 0000 e000 0002
1573600  0000 2ce4 0000 0000 4400 0388 0002 3bec 0005 6db1 0400 0000 0002 3c00 0005 6dba 0400 0000 0002 4bd0 0005 6dc4 0400 0000
1573660  0002 54bc 0005 6dce 0400 0000 0002 422c 0005 6dd8 0400 0000 0002 5a13 0005 6de2 0400 0000 0002 4f7c 0005 6dee 0800 0000
```

```
1573740 0004 a604 0005 6df8 0400 0000 0002 4088 0005 6e02 0400 0000 0002 5a4c 0005 6e0c 0800 0000 0004 a618 0005 6e16 0400 0000
1574020 0002 3c00 0005 6e20 0800 0000 0004 a7b0 0005 6e2a 0400 0000 0002 3e70 0005 6e34 0400 0000 0002 5334 0005 6e3e 0400 0000
1574100 0002 3f68 0005 6e47 0600 0000 0004 074c 0005 6e4e 0800 0000 0004 a61c 0005 6e54 0600 0000 0004 070c 0005 6e5e 0800 0000
1574160 0004 aeb0 0005 6e68 0400 0000 0002 620c 0005 6e72 0800 0000 0004 a5fc 0005 6e7c 0400 0000 0002 5b34 0005 6e87 0400 0000
1574240 0002 5f68 0005 6e92 0800 0000 0004 a7ac 0005 6e9c 0800 0000 0004 adb0 0005 6ea7 0800 0000 0004 a608 0005 6eb1 0400 0000
1574320 0002 573c 0005 6ec0 0400 0000 0002 4cd0 0005 6ecb 0800 0000 0004 a8b0 0005 6ed6 0400 0000 0002 5418 0005 6ee1 0400 0000
1574400 0002 5aa0 0005 6eec 0800 0000 0004 a60c 0005 6ef4 0800 0000 0004 abb0 0005 6efa 0400 0000 0002 3c58 0005 6f04 0600 0000
1574460 0004 0694 0005 6f0b 0800 0000 0004 a600 0005 6f12 0600 0000 0004 06d0 0005 6f1d 0600 0000 0004 0654 0005 6f28 0400 0000
1574540 0002 3fd4 0005 6f33 0400 0000 0002 604c 0005 6f3e 0600 0000 0004 0618 0005 6f45 0400 0000 0002 3cb8 0005 6f50 0800 0000
1574620 0004 a614 0005 6f5b 0400 0000 0002 554c 0005 6f67 0600 0000 0004 09fc 0005 6f73 0400 0000 0002 3cfc 0005 6f7e 0400 0000
1574700 0002 5bdc 0005 6f86 0800 0000 0004 a9b0 0005 6f91 0400 0000 0002 4170 0005 6f9a 0400 0000 0002 5cc0 0005 6fa3 0800 0000
1574760 0004 a610 0005 6fac 0400 0000 0002 6158 0005 6fb5 0400 0000 0002 57c4 0005 6fc2 0400 0000 0002 5ea4 0005 6fce 0400 0000
1575040 0002 4290 0005 6fdb 0800 0000 0004 acb0 0005 6fe3 0800 0000 0004 aab0 0005 6fe9 0800 0000 0004 a5f8 0005 6fef 0400 0000
1575120 0002 53c0 0005 6ffb 6400 0000 0002 3c00 0005 7022 6400 0000 0002 3c00 0005 702b 8000 0000 0000 0000 0005 7055 8000 0000
1575200 0000 0000 0005 706f 8000 0000 0000 0000 0005 709a 8000 0000 0000 0000 0005 70bc 8000 0000 0000 0000 0005 70df 8000 0000
1575260 0000 0000 0005 7105 8000 0000 0000 0000 0005 7127 8000 0000 0000 0000 0005 7148 8000 0000 0000 0000 0005 7161 8000 0000
1575340 0000 0000 0005 717c 8000 0000 0000 0000 0005 7190 8000 0000 0000 0000 0005 71a2 2600 0001 0004 0518 0005 71c3 c200 0000
1575420 0000 0ff2 0005 71d8 8200 0000 0000 1b24 0005 71e4 8400 0000 0002 3c00 0005 71f0 2600 0001 0004 0654 0005 7214 8200 0000
1575500 0000 2882 0005 7236 8400 0000 0002 3c00 0005 7258 2600 0001 0004 0694 0005 7278 8000 0001 ffff fb05 0005 72fa 8000 0004
1575560 ffff fb05 0005 7309 8000 0004 ffff fb05 0005 7339 8000 0004 ffff fb05 0000 0000 a200 0000 0000 0000 0005 7359 2000 0004
1575640 0000 0000 0005 736e 2000 0004 0000 0000 0005 737e 2000 0004 0000 0000 0000 0000 a200 0000 0000 0000 0005 739d 8200 0000
1575720 0000 0bf9 0005 73a9 8400 0000 0002 3c00 0005 73b5 2600 0001 0004 06d0 0005 73c6 c200 0000 0000 0000 0005 73d2 c200 0000
1576000 0000 07e7 0005 73f4 8000 0004 ffff fb05 0000 0000 a200 0000 0000 0000 0005 7406 a200 0000 0000 1cf1 0005 7411 8400 0000
1576060 0002 3c00 0005 741c 2600 0001 0004 070c 0005 743f 8000 0010 ffff fb05 0005 74af 8000 0010 ffff fb05 0000 0000 a200 0000
1576140 0000 0000 0005 74bf 8000 0001 ffff fb05 0005 74cd 2600 0001 0004 074c 0005 74ef 8000 0010 ffff fb05 0005 755f 8000 0010
1576220 ffff fb05 0005 756f 8000 0010 ffff fb05 0005 757c 8000 0014 ffff fb05 0005 75f1 8000 0014 ffff fb05 0005 7601 8000 0014
1576300 ffff fb05 0005 760e 2000 0004 0000 0000 0005 761f 8400 0000 0002 3c00 0005 7626 2000 0001 0000 0000 0005 7638 2000 0001
1576360 0000 0000 0005 7647 2000 0001 0000 0000 0005 7657 2000 0001 0000 0000 0005 7666 2000 0001 0000 0000 0005 7675 2000 0001
1576440 0000 0000 0005 7684 2000 0001 0000 0000 0005 7693 2000 0001 0000 0000 0005 76a3 2000 0001 0000 0000 0005 76b2 2000 0001
1576520 0000 0000 0005 76c2 2000 0001 0000 0000 0005 76d2 2000 0001 0000 0000 0005 76e2 2000 0001 0000 0000 0005 76f5 2000 0001
1576600 0000 0000 0005 7706 2000 0001 0000 0000 0005 7717 2600 0004 0004 09fc 0005 7729 2800 0014 0004 a5f8 0005 7736 2800 0014
1576660 0004 a5fc 0005 7747 2800 0004 0004 a600 0005 7754 2800 0004 0004 a604 0005 7764 2800 0004 0004 a608 0005 7774 2800 0004
1576740 0004 a60c 0005 7782 2800 0004 0004 a610 0005 7791 2800 0001 0004 a614 0005 77a2 2800 0001 0004 a618 0005 77b2 2800 0001
1577020 0004 a61c 0005 77d2 2800 0010 0004 a7ac 0005 77e3 2800 0001 0004 a7b0 0005 7808 2800 0001 0004 adb0 0005 781a 2800 0001
1577100 0004 a9b0 0005 782c 2800 0001 0004 aab0 0005 7839 2800 0001 0004 abb0 0005 7846 2800 0001 0004 acb0 0005 7855 2800 0001
1577160 0004 adb0 0005 7867 2800 0001 0004 aeb0 0005 788a 2400 0004 0002 3c00 0005 789a a000 0001 0000 0044 0005 78a3 a000 0001
1577240 0000 0048 0005 78ad a000 0001 0000 004c 0000 0000 4400 019b 0002 3c00 0000 0000 4400 019b 0002 3c18 0000 0000 4400 019c
1577320 0002 3c18 0000 0000 4400 019d 0002 3c2c 0000 0000 4400 01a1 0002 3c3c 0000 0000 4400 01a3 0002 3c48 0005 78b7 2400 0001
1577400 0002 3c58 0005 78c7 a000 0001 0000 0044 0000 0000 4400 01a7 0002 3c58 0000 0000 4400 01a7 0002 3c68 0005 78d0 8000 0001
1577460 ffff fffc 0000 0000 c000 0002 0000 0068 0000 0000 4400 01aa 0002 3c68 0000 0000 4400 01ab 0002 3c8c 0000 0000 4400 01ac
1577540 0002 3c9c 0000 0000 e000 0002 0000 00a8 0000 0000 4400 01ad 0002 3ca8 0005 78d8 2400 0014 0002 3cb8 0000 0000 4400 01b2
1577620 0002 3cb8 0000 0000 4400 01b2 0002 3cc4 0005 78ea 8000 0014 ffff fffc 0000 0000 c000 0002 0000 00c4 0000 0000 4400 01b5
1577700 0002 3cc4 0000 0000 4400 01ba 0002 3ce0 0000 0000 e000 0002 0000 00ec 0000 0000 4400 01bb 0002 3cec 0005 78f4 2400 0004
1577760 0002 3cfc 0005 7905 a000 0014 0000 0044 0000 0000 4400 01bf 0002 3cfc 0000 0000 4400 01bf 0002 3d0c 0005 7910 8000 0004
1600040 ffff fffc 0005 7919 8000 0001 ffff fff8 0000 0000 c000 0002 0000 010c 0000 0000 4400 01c3 0002 3d0c 0000 0000 4400 01c4
1600120 0002 3d18 0000 0000 4400 01c5 0002 3d6c 0000 0000 4400 01c6 0002 3d8c 0000 0000 4400 01c7 0002 3d9c 0000 0000 4400 01c8
1600200 0002 3da4 0000 0000 4400 01c9 0002 3dbc 0000 0000 4400 01ca 0002 3dd4 0000 0000 4400 01cc 0002 3e30 0000 0000 4400 01cd
1600260 0002 3e38 0000 0000 e000 0002 0000 0260 0000 0000 4400 01ce 0002 3e60 0005 7923 2400 0001 0002 3e70 0005 7933 a000 0001
1600340 0000 0044 0000 0000 4400 01d2 0002 3e70 0000 0000 4400 01d2 0002 3e80 0005 793e 8000 0001 ffff fffc 0000 0000 c000 0002
1600420 0000 0280 0000 0000 4400 01d5 0002 3ed0 0000 0000 4400 01d6 0002 3e98 0000 0000 4400 01d7 0002 3eac 0000 0000 4400 01d8
1600500 0002 3eb8 0000 0000 4400 01d9 0002 3ee8 0000 0000 4400 01da 0002 3f18 0000 0000 4400 01db 0002 3f20 0000 0000 4400 01dc
1600560 0002 3f38 0000 0000 4400 01dd 0002 3f4c 0000 0000 e000 0002 0000 0358 0000 0000 4400 01de 0002 3f58 0005 7946 2400 0001
1600640 0002 3f68 0005 7955 a000 0001 0000 0044 0005 7960 a000 0001 0000 0048 0000 0000 4400 01e4 0002 3f68 0000 0000 4400 01e4
1600720 0002 3f7c 0000 0000 4400 01e5 0002 3f7c 0000 0000 4400 01e6 0002 3f8c 0000 0000 4400 01e7 0002 3f98 0000 0000 4400 01e8
1601000 0002 3fa8 0000 0000 4400 01e9 0002 3fc4 0005 7969 2400 0001 0002 3fd4 0000 0000 4400 01ec 0002 3fd4 0000 0000 4400 01ec
```

```
1601060 0002 3fe0 0005 797a 8000 0004 ffff fffc 0000 0000 c000 0002 0000 03e0 0000 0000 4400 01ef 0002 3fe0 0000 0000 4400 01f0
1601140 0002 3ff4 0000 0000 4400 01f1 0002 4000 0000 0000 4400 01f2 0002 4014 0000 0000 4400 01f3 0002 403c 0000 0000 4400 01f4
1601220 0002 4048 0000 0000 4400 01f5 0002 4068 0000 0000 e000 0002 0000 0478 0000 0000 4400 01f6 0002 4078 0005 7982 2400 0001
1601300 0002 4088 0005 7992 a000 0001 0000 0044 0000 0000 4400 01fa 0002 4088 0000 0000 4400 01fa 0002 4098 0005 799b 8000 0001
1601360 ffff fffc 0000 0000 c000 0002 0000 0498 0000 0000 4400 01fd 0002 4098 0000 0000 4400 01fe 0002 40b0 0000 c000 4400 01ff
1601440 0002 40bc 0000 0000 4400 0200 0002 40d8 0000 0000 4400 0201 0002 4108 0000 0000 4400 0202 0002 4134 0000 0000 4400 0203
1601520 0002 4140 0000 0000 4400 0205 0002 4154 0000 0000 e000 0002 0000 0560 0000 0000 4400 0206 0002 4160 0005 79a5 2400 0001
1601600 0002 4170 0005 73b4 a000 0001 0000 0044 0000 0000 4400 020a 0002 4170 0000 0000 4400 020a 0002 4180 0005 79b1 8000 0001
1601660 ffff fffc 0000 0000 c000 0002 0000 0580 0000 0000 4400 020d 0002 4180 0000 0000 4400 020e 0002 4198 0000 0000 4400 020f
1601740 0002 41a4 0000 0000 4400 0210 0002 41c0 0000 0000 4400 0211 0002 41d8 0000 0000 4400 0212 0002 41ec 0000 0000 4400 0213
1602020 0002 41f8 0000 0000 4400 0215 0002 420c 0000 0000 e000 0002 0000 061c 0000 0000 4400 0216 0002 421c 0005 79c7 2400 0004
1602100 0002 422c 0005 79d7 a000 0001 0000 0044 0005 79e1 a000 0001 0000 0048 0000 0000 4400 021a 0002 422c 0000 0000 4400 021a
1602160 0002 4240 0005 79eb 2600 0004 0004 0a00 0000 0000 c000 0002 0000 03ec 0000 0000 4400 021d 0002 4240 0000 0000 4400 021e
1602240 0002 4254 0000 0000 4400 021f 0002 425c 0000 0000 4400 0220 0002 4274 0000 0000 e000 0002 0000 0680 0000 0000 4400 0221
1602320 0002 4280 0005 79fa 2400 0004 0002 4290 0005 7a0d a000 0001 0000 0044 0005 7a1a a000 0001 0000 0048 0005 7a27 a000 0004
1602400 0000 004c 0000 0000 4400 0226 0002 4290 0000 0000 4400 0226 0002 42a8 0005 7a36 8000 0014 ffff fffc 0005 7a40 8000 0001
1602460 ffff fff8 0005 7a4a 8000 0001 ffff fff4 0005 7a54 8000 0001 ffff fff0 0005 7a5e 8000 0001 ffff ffec 0005 7a6b 8000 0001
1602540 ffff ffeb 0005 7a74 8000 0001 ffff ffe4 0005 7a7e 8000 0004 ffff ffe0 0005 7a8a 8000 0001 ffff fee0 0005 7a96 8000 0001
1602620 ffff fede 0000 0000 c000 0002 0000 06a8 0000 0000 4400 022e 0002 42a8 0000 0000 4400 022f 0002 42b8 0000 0000 4400 0230
1602700 0002 42c0 0000 0000 4400 0232 0002 42c4 0000 0000 4400 0233 0002 42d4 0000 0000 4400 0234 0002 42e4 0000 0000 4400 0235
1602760 0002 42f4 0000 0000 4400 0236 0002 4304 0000 0000 4400 0238 0002 4320 0000 0000 4400 0239 0002 4328 0000 0000 4400 023a
1603040 0002 4338 0000 0000 4400 023b 0002 4348 0000 0000 4400 023c 0002 435c 0000 0000 4400 023d 0002 4374 0000 0000 4400 023e
1603120 0002 4380 0000 0000 4400 023f 0002 4390 0000 0000 4400 0242 0002 439c 0000 0000 4400 0243 0002 43a8 0000 0000 4400 0244
1603200 0002 43d0 0000 0000 4400 0245 0002 43f0 0000 0000 4400 0246 0002 4434 0000 0000 4400 0247 0002 446c 0000 0000 4400 0248
1603260 0002 4478 0000 0000 4400 0249 0002 4484 0000 0000 4400 024a 0002 449c 0000 0000 4400 024b 0002 4498 0000 0000 4400 024c
1603340 0002 44a8 0000 0000 4400 024d 0002 44ac 0000 0000 4400 024e 0002 44b0 0000 0000 4400 024f 0002 44b8 0000 0000 4400 0250
1603420 0002 44d0 0000 0000 4400 0251 0002 44e8 0000 0000 4400 0252 0002 44e8 0000 0000 4400 0253 0002 4500 0000 0000 4400 0254
1603500 0002 4514 0000 0000 4400 0255 0002 4524 0000 0000 4400 0256 0002 452c 0000 0000 4400 0258 0002 4534 0000 0000 4400 025a
1603560 0002 453c 0000 0000 4400 025b 0002 4554 0000 0000 4400 025c 0002 4568 0000 0000 4400 025d 0002 457c 0000 0000 4400 025e
1603640 0002 4590 0000 0000 4400 025f 0002 45a4 0000 0000 4400 0260 0002 45b8 0000 0000 4400 0261 0002 45c8 0000 0000 4400 0262
1603720 0002 45dc 0000 0000 4400 0263 0002 45f0 0000 0000 4400 0264 0002 4604 0000 0000 4400 0265 0002 4618 0000 0000 4400 0266
1604000 0002 462c 0000 0000 4400 0267 0002 4640 0000 0000 4400 0268 0002 4654 0000 0000 4400 0269 0002 4668 0000 0000 4400 026a
1604060 0002 467c 0000 0000 4400 026b 0002 468c 0000 0000 4400 026c 0002 46a0 0000 0000 4400 026d 0002 46b4 0000 0000 4400 026e
1604140 0002 46c8 0000 0000 4400 0270 0002 46dc 0000 0000 4400 0271 0002 46e4 0000 0000 4400 0272 0002 46f8 0000 0000 4400 0274
1604220 0002 4700 0000 0000 4400 0275 0002 4718 0000 0000 4400 0276 0002 472c 0000 0000 4400 0277 0002 4740 0000 0000 4400 0278
1604300 0002 4754 0000 0000 4400 0279 0002 4768 0000 0000 4400 027a 0002 477c 0000 0000 4400 027b 0002 4790 0000 0000 4400 027c
1604360 0002 47a4 0000 0000 4400 027d 0002 47b8 0000 0000 4400 027e 0002 47cc 0000 0000 4400 0280 0002 47e0 0000 0000 4400 0281
1604440 0002 47e8 0000 0000 4400 0282 0002 47fc 0000 0000 4400 0284 0002 4804 0000 0000 4400 0285 0002 4820 0000 0000 4400 0286
1604520 0002 4828 0000 0000 4400 0287 0002 4840 0000 0000 4400 0288 0002 4858 0000 0000 4400 0289 0002 4860 0000 0000 4400 028a
1604600 0002 486c 0000 0000 4400 028b 0002 487c 0000 0000 4400 028c 0002 4890 0000 0000 4400 028d 0002 48c0 0000 0000 4400 028f
1604660 0002 48d4 0000 0000 4400 0291 0002 48dc 0000 0000 4400 0292 0002 48f8 0000 0000 4400 0293 0002 4900 0000 0000 4400 0294
1604740 0002 4908 0000 0000 4400 0295 0002 491c 0000 0000 4400 0296 0002 492c 0000 0000 4400 0297 0002 4944 0000 0000 4400 0298
1605020 0002 4960 0000 0000 4400 0299 0002 4970 0000 0000 4400 029a 0002 4984 0000 0000 4400 029b 0002 49a0 0000 0000 4400 029d
1605100 0002 49a8 0000 0000 4400 029e 0002 49c0 0000 0000 4400 029f 0002 49d8 0000 0000 4400 02a0 0002 49e4 0000 0000 4400 02a1
1605160 0002 49ec 0000 0000 4400 02a3 0002 4a04 0000 0000 4400 02a4 0002 4a13 0000 0000 4400 02a5 0002 4a28 0000 0000 4400 02a6
1605240 0002 4a3c 0000 0000 4400 02a7 0002 4a44 0000 0000 4400 02a9 0002 4a58 0000 0000 4400 02aa 0002 4a70 0000 0000 4400 02ab
1605320 0002 4a88 0000 0000 4400 02ac 0002 4a9c 0000 0000 4400 02ae 0002 4a98 0000 0000 4400 02af 0002 4ab0 0000 0000 4400 02b1
1605400 0002 4ab8 0000 0000 4400 02b2 0002 4a34 0000 0000 4400 02b3 0002 4adc 0000 0000 4400 02b4 0002 4ae4 0000 0000 4400 02b5
1605460 0002 4af0 0000 0000 4400 02b7 0002 4af8 0000 0000 4400 02b8 0002 4b10 0000 0000 4400 0258 0002 4b18 0000 0000 4400 02bb
1605540 0002 4b60 0000 0000 4400 02bc 0002 4b68 0000 0000 4400 02bd 0002 4b90 0000 0000 4400 02be 0002 4ba4 0000 0000 4400 02bf
1605620 0002 4bac 0000 0000 e000 0002 0000 0fc0 0000 0000 4400 02c1 0002 4bc0 0005 7abb 2400 0004 0002 4bd0 0005 7acb a000 0014
1605700 0000 0044 0000 0000 4400 02c5 0002 4bd0 0000 0000 4400 02c5 0002 4be0 0005 7ad6 8000 0010 ffff fffc 0000 0000 c000 0002
1605760 0000 0fe0 0000 0000 4400 02c8 0002 4be0 0000 0000 4400 02c9 0002 4bf0 0000 0000 4400 02ca 0002 4bf8 0000 0000 4400 02cb
1606040 0002 4c40 0000 0000 4400 02cc 0002 4c50 0000 0000 4400 02cd 0002 4c68 0000 0000 4400 02ce 0002 4c78 0000 0000 4400 02cf
1606120 0002 4c94 0000 0000 4400 02d1 0002 4c90 0000 0000 4400 02d2 0002 4ca8 0000 0000 e000 0002 0000 10c0 0000 0000 4400 02d3
```

```
1606200  0002 4cc0 0005 7ae1 2400 0014 0002 4cd0 0005 7af3 a000 0004 0000 0044 0000 0000 4400 02d7 0002 4cd0 0000 0000 4400 02d7
1606260  0002 4ce0 0005 7b02 8000 0004 ffff fffc 0005 7b0a 8000 0004 ffff fff8 0005 7b14 8000 0001 ffff fff4 0005 7b1f 8000 0014
1606340  ffff fff0 0000 0000 c000 0002 000c 10e0 0000 0000 4400 02dc 0002 4ce0 0000 0000 4400 02dd 0002 410c 0000 0000 4400 02de
1606420  0002 4d38 0000 0000 4400 02df 0002 4d40 0000 0000 4400 02e0 0002 4d48 0000 0000 4400 02e2 0002 4151 0000 0000 4400 02e3
1606500  0002 4d54 0000 0000 4400 02e4 0002 4d78 0000 0000 4400 02e5 0002 4d9c 0000 0000 4400 02e6 0002 4dbc 0000 0000 4400 02e7
1606560  0002 4dec 0000 0000 4400 02e8 0002 4e04 0000 0000 4400 02e9 0002 4e0c 0000 0000 4400 02ea 0002 4e14 0000 0000 4400 02eb
1606640  0002 4e24 0000 0000 4400 02ec 0002 4e3c 0000 0000 4400 02ee 0002 4e5c 0000 0000 4400 02ef 0002 4e70 0000 0000 4400 02f0
1606720  0002 4e7c 0000 0000 4400 02f1 0002 4e88 0000 0000 4400 02f2 0002 4ea8 0000 0000 4400 02f3 0002 4eb4 0000 0000 4400 02f4
1607000  0002 4ec0 0000 0000 4400 02f5 0002 4ee0 0000 0000 4400 02f6 0002 4ef4 0000 0000 4400 02e3 0002 4f00 0000 0000 4400 02fa
1607060  0002 4f14 0000 0000 4400 02fb 0002 4f24 0000 0000 4400 02fc 0002 4f3c 0000 0000 4400 02fe 0002 4f54 0000 0000 4400 0300
1607140  0002 4f60 0000 0000 e00c 0002 0000 136c 0000 0000 4400 0301 0002 4f6c 0005 7b29 2400 0004 0002 4f7c 0005 7b3b a000 0001
1607220  0000 0044 0005 7b47 a000 0001 0000 0048 0005 7b54 a000 0001 0000 004c 0005 7b61 a000 0014 0000 0050 0000 0000 4400 0306
1607300  0002 4f7c 0000 0000 4400 0306 0002 4f98 0000 0000 4400 0307 0002 4f98 0000 0000 4400 0308 0002 4f98 0000 0000 4400 0309
1607360  0002 4f98 0000 0000 4400 030a 0002 4f98 0000 0000 4400 030b 0002 5030 0005 7b6c 2400 0004 0002 5040 0000 0000 4400 0310
1607440  0002 5040 0000 0000 4400 0310 0002 504c 0000 0000 4400 0311 0002 504c 0000 0000 4400 0312 0002 5078 0000 0000 4400 0313
1607520  0002 508c 0000 0000 4400 0315 0002 509c 0000 0000 4400 0317 0002 50a4 0005 7b7c 2400 0014 0002 50b4 0005 7b8d a000 0001
1607600  0000 0044 0005 7b9a a000 0001 0000 0048 0000 0000 4400 031b 0002 50b4 0000 0000 4400 031b 0002 50c8 0005 7ba7 8000 0014
1607660  ffff fffc 0000 0000 c000 0002 0000 14c8 0000 0000 4400 031e 0002 50c8 0000 0000 4400 031f 0002 50d0 0000 0000 4400 0320
1607740  0002 50e4 0000 0000 4400 0321 0002 50f4 0000 0000 4400 0322 0002 5108 0000 0000 4400 0323 0002 5124 0000 0000 e000 0002
1610020  0000 1530 0000 0000 4400 0324 0002 5130 0005 7bb1 2400 0014 0002 5140 0005 7bc1 a000 0001 0000 0044 0005 7bce a000 0001
1610100  0000 0048 0000 0000 4400 0328 0002 5140 0000 0000 4400 0328 0002 5154 0005 7bdb 8000 0014 ffff fffc 0000 0000 c000 0002
1610160  0000 1554 0000 0000 4400 032b 0002 5154 0000 0000 4400 032c 0002 515c 0000 0000 4400 032d 0002 5170 0000 0000 4400 032e
1610240  0002 5180 0000 0000 4400 032f 0002 5194 0000 0000 4400 0330 0002 51b0 0000 0000 e000 0002 0000 15bc 0000 0000 4400 0331
1610320  0002 51bc 0005 7be5 2400 0001 0002 51cc 0005 7bf9 a000 0014 0000 0044 0000 0000 4400 0335 0002 51cc 0000 0000 4400 0335
1610400  0002 51dc 0005 7c04 8000 0010 ffff fffc 0000 0000 c000 0002 0000 15dc 0000 0000 4400 0338 0002 51dc 0000 0000 4400 0339
1610460  0002 51ec 0000 00c0 4400 033a 0002 51fc 0000 0000 4400 033b 0002 5244 0000 0000 e000 0002 0000 1670 0000 0000 4400 033c
1610540  0002 5270 0005 7c0f 2400 0001 0002 5280 0005 7c1e a000 0014 0000 0044 0000 0000 4400 0340 0002 5280 0000 0000 4400 0340
1610620  0002 5290 0005 7c29 8000 0010 ffff fffc 0000 0000 c000 0002 0000 1690 0000 0000 4400 0343 0002 5290 0000 0000 4400 0344
1610700  0002 52a0 0000 0000 4400 0345 0002 52b0 0000 0000 4400 0346 0002 52f8 0000 0000 e000 0002 0000 1724 0000 0000 4400 0347
1610760  0002 5324 0005 7c34 2400 0004 0002 5334 0000 0000 4400 034c 0002 5334 0000 0000 4400 034c 0002 5340 0000 0000 4400 034d
1611040  0002 5340 0000 0000 4400 034e 0002 5354 0000 0000 4400 034f 0002 535c 0000 0000 4400 0350 0002 5368 0000 0000 4400 0351
1611120  0002 537c 0000 0000 4400 0352 0002 5398 0000 0000 4400 0353 0002 53a0 0000 0000 4400 0354 0002 53a8 0000 0000 4400 0355
1611200  0002 53b0 0005 7c44 2400 0004 0002 53c0 0000 0000 4400 0358 0002 53c0 0000 0000 4400 0358 0002 53cc 0000 0000 4400 0359
1611260  0002 53cc 0000 0000 4400 035a 0002 53d4 0000 0000 4400 035b 0002 53dc 0000 0000 4400 035c 0002 53ec 0000 0000 4400 035d
1611340  0002 53f8 0000 0000 4400 035e 0002 5400 0000 0000 4400 035f 0002 5408 0005 7c56 2400 0004 0002 5418 0000 0000 4400 0364
1611420  0002 5418 0000 0000 4400 0364 0002 5424 0000 0000 4400 0365 0002 5424 0000 0000 4400 0366 0002 5434 0000 0000 4400 0367
1611500  0002 5440 0000 0000 4400 0368 0002 5450 0000 0000 4400 0369 0002 5458 0000 0000 4400 036a 0002 5460 0000 0000 4400 036b
1611560  0002 5470 0000 0000 4400 036c 0002 5480 0000 0000 4400 036d 0002 549c 0000 0000 4400 036e 0002 54ac 0005 7c67 2400 0004
1611640  0002 54bc 0005 7c77 a000 0001 0000 0044 0000 0000 4400 0372 0002 54bc 0000 0000 4400 0372 0002 54cc 0005 7c80 8000 0001
1611720  ffff fffc 0000 0000 c000 0002 0000 18cc 0000 0000 4400 0375 0002 54cc 0000 0000 4400 0376 0002 54e8 0000 0000 4400 0377
1612000  0002 5518 0000 0000 4400 0378 0002 552c 0000 0000 e000 0002 0000 193c 0000 0000 4400 037a 0002 553c 0005 7c8a 2400 0004
1612060  0002 554c 0005 7c9c a000 0001 0000 0044 0005 7ca7 a000 0001 0000 0048 0000 0000 4400 037e 0002 554c 0000 0000 4400 037e
1612140  0002 5560 0005 7cb2 8000 0001 ffff fffc 0000 0000 c000 0002 0000 1960 0000 0000 4400 0381 0002 5560 0000 0000 4400 0382
1612220  0002 5578 0000 0000 4400 0383 0002 5584 0000 0000 4400 0384 0002 559c 0000 0000 4400 0385 0002 55ac 0000 0000 4400 0386
1612300  0002 55c4 0000 0000 4400 0387 0002 55d8 0000 0000 4400 0388 0002 55ec 0000 0000 4400 038a 0002 560c 0000 0000 4400 038b
1612360  0002 5624 0000 0000 4400 038c 0002 5630 0000 0000 4400 038d 0002 5648 0000 0000 4400 038e 0002 5660 0000 0000 4400 038f
1612440  0002 566c 0000 0000 4400 0390 0002 5684 0000 0000 4400 0391 0002 5690 0000 0000 4400 0392 0002 56bc 0000 0000 4400 0393
1612520  0002 56c8 0000 0000 4400 0396 0002 5710 0000 0000 4400 0397 0002 5720 0000 0000 e000 0002 0000 1b2c 0000 0000 4400 0398
1612600  0002 572c 0005 7cbc 2400 0004 0002 573c 0005 7cd1 a000 0001 0000 0044 0000 0000 4400 039c 0002 573c 0000 0000 4400 039c
1612660  0002 574c 0005 7cdf 8000 0001 ffff fffc 0005 7ce7 8000 0001 ffff fefc 0000 0000 c000 0002 0000 1b4c 0000 0000 4400 03a0
1612740  0002 574c 0000 0000 4400 03a1 0002 575c 0000 0000 4400 03a2 0002 576c 0000 0000 4400 03a3 0002 5774 0000 0000 4400 03a4
1613020  0002 5784 0000 0000 4400 03a5 0002 5798 0000 0000 4400 03a6 0002 57a8 0000 0000 e000 0002 0000 1bb4 0000 0000 4400 03a7
1613100  0002 57b4 0005 7cf2 2400 0004 0002 57c4 0005 7d05 a000 0001 0000 0044 0000 0000 4400 03ab 0002 57c4 0000 0000 4400 03ab
1613160  0002 57d4 0005 7d14 8000 0014 ffff fffc 0005 7d1e 8000 0001 ffff fff8 0005 7d29 8000 0001 ffff fef8 0000 0000 c000 0002
1613240  0000 1bd4 0000 0000 4400 03b0 0002 57d4 0000 0000 4400 03b1 0002 57e8 0000 0000 4400 03b2 0002 57f8 0000 0000 4400 03b3
```

```
1613320 0002 5828 0000 0000 4400 03b4 0002 5868 0000 0000 4400 03b5 0002 5870 0000 0000 4400 03b6 0002 5884 0000 0000 4400 03b7
1613400 0002 589c 0000 0000 4400 03b8 0002 58ac 0000 0000 4400 03b9 0002 58b8 0000 0000 4400 03ba 0002 58c8 0000 0000 4400 03bb
1613460 0002 58d0 0000 0000 4400 03bc 0002 58dc 0000 0000 4400 03bd 0002 58ec 0000 0000 4400 03be 0002 5910 0000 0000 4400 03bf
1613540 0002 5924 0000 0000 4400 03c0 0002 5930 0000 0000 4400 03c2 0002 5940 0000 0000 4400 03c3 0002 5958 0000 0000 4400 03c4
1613620 0002 5970 0000 0000 4400 03c5 0002 5980 0000 0000 4400 03c7 0002 599c 0000 0000 4400 03c8 0002 59b0 0000 0000 4400 03ca
1613700 0002 59bc 0000 0000 4400 03cb 0002 59cc 0000 0000 4400 03cc 0002 59d8 0000 0000 4400 03cd 0002 59e4 0000 0000 4400 03cf
1613760 0002 59fc 0000 0000 e000 0002 0000 1e08 0000 0000 4400 03d0 0002 5a08 0005 7d34 2400 0004 0002 5a18 0000 0000 4400 03d5
1614040 0002 5a18 0000 0000 4400 03d5 0002 5a24 0000 0000 4400 03d6 0002 5a24 0000 0000 4400 03d7 0002 5a3c 0005 7d44 2400 0001
1614120 0002 5a4c 0005 7d54 a000 0001 0000 0044 0000 0000 4400 03db 0002 5a4c 0000 0000 4400 03db 0002 5a5c 0000 0000 4400 03dc
1614200 0002 5a5c 0000 0000 4400 03dd 0002 5a74 0000 0000 4400 03de 0002 5a7c 0000 0000 4400 03df 0002 5a90 0005 7d5d 2400 0004
1614260 0002 5aa0 0000 0000 4400 03e2 0002 5aa0 0000 0000 4400 03e2 0002 5aac 0005 7d6e 8000 0004 ffff fffc 0000 0000 c000 0002
1614340 0000 1eac 0000 0000 4400 03e5 0002 5aac 0000 0000 4400 03e6 0002 5ab9 0000 0000 4400 03e7 0002 5adc 0000 0000 4400 03e6
1614420 0002 5af8 0000 0000 4400 03e8 0002 5b0c 0000 0000 4400 03e9 0002 5b14 0000 0000 e000 0002 0000 1f24 0000 0000 4400 03ea
1614500 0002 5b24 0005 7d76 2400 0004 0002 5b34 0005 7d87 a000 0001 0000 0044 0000 0000 4400 03ee 0002 5b34 0000 0000 4400 03ee
1614560 0002 5b44 0005 7d90 8000 0014 ffff fffc 0005 7d9a 8000 0004 ffff fff8 0000 0000 c000 0002 0000 1f44 0000 0000 4400 03f2
1614640 0002 5b44 0000 0000 4400 03f3 0002 5b58 0000 0000 4400 03f4 0002 5b68 0000 0000 4400 03f5 0002 5b78 0000 0000 4400 03f6
1614720 0002 5b80 0000 0000 4400 03f7 0002 5b80 0000 0000 4400 03f8 0002 5b90 0000 0000 4400 03f9 0002 5ba0 0000 0000 4400 03fa
1615000 0002 5bb0 0000 0000 4400 03fb 0002 5bc0 0000 0000 e000 0002 0000 1fcc 0000 0000 4400 03fc 0002 5bcc 0005 7da6 2400 0014
1615060 0002 5bdc 0005 7db5 a000 0001 0000 0044 0000 0000 4400 0400 0002 5bdc 0000 0000 4400 0400 0002 5bec 0005 7dbe 8000 0014
1615140 ffff fffc 0000 0000 c000 0002 0000 1fec 0000 0000 4400 0403 0002 5bec 0000 0000 4400 0404 0002 5c14 0000 0000 4400 0405
1615220 0002 5c20 0000 0000 4400 0406 0002 5c38 0000 0000 4400 0407 0002 5c48 0000 0000 4400 0408 0002 5c54 0000 0000 4400 0409
1615300 0002 5c5c 0000 0000 4400 040a 0002 5c64 0000 0000 4400 040b 0002 5c6c 0000 0000 4400 040c 0002 5c88 0000 0000 4400 040d
1615360 0002 5c98 0000 0000 4400 040e 0002 5ca4 0000 0000 e000 0002 0000 20b0 0000 0000 4400 040f 0002 5cb0 0005 7dc7 2400 0004
1615440 0002 5cc0 0005 7dd6 a000 0001 0000 0044 0000 0000 4400 0413 0002 5cc0 0000 0000 4400 0413 0002 5cd0 0000 0000 4400 0414
1615520 0002 5cd0 0000 0000 4400 0415 0002 5cdc 0000 0000 4400 0416 0002 5d0c 0000 0000 4400 0417 0002 5d20 0000 0000 4400 0418
1615600 0002 5d7c 0000 0000 4400 0419 0002 5d84 0000 0000 4400 041a 0002 5d9c 0000 0000 4400 041b 0002 5da4 0000 0000 4400 041c
1615660 0002 5dac 0000 0000 4400 041d 0002 5db8 0000 0000 4400 041e 0002 5db8 0000 0000 4400 041f 0002 5dc8 0000 0000 4400 0420
1615740 0002 5de0 0000 0000 4400 0421 0002 5de8 0000 0000 4400 0422 0002 5e0c 0000 0000 4400 0423 0002 5e18 0000 0000 4400 0425
1616020 0002 5e20 0000 0000 4400 0426 0002 5e30 0000 0000 4400 0427 0002 5e48 0000 0000 4400 0428 0002 5e5c 0000 0000 4400 0429
1616100 0002 5e74 0000 0000 4400 042b 0002 5e88 0000 0000 4400 042d 0002 5e94 0005 7ddf 2400 0004 0002 5ea4 0005 7df1 a000 0001
1616160 0000 0044 0000 0000 4400 0431 0002 5ea4 0000 0000 4400 0431 0002 5eb4 0005 7dfa 8000 0014 ffff fffc 0005 7e04 8000 0001
1616240 ffff fefc 0000 0000 c000 0002 0000 22b4 0000 0000 4400 0435 0002 5eb4 0000 0000 4400 0436 0002 5ec0 0000 0000 4400 0437
1616320 0002 5ed0 0000 0000 4400 0438 0002 5edc 0000 0000 4400 0439 0002 5ee4 0000 0000 4400 043a 0002 5ef8 0000 0000 4400 043b
1616400 0002 5f08 0000 0000 4400 043c 0002 5f18 0000 0000 4400 043d 0002 5f30 0000 0000 4400 043e 0002 5f40 0000 0000 e000 0002
1616460 0000 2358 0000 0000 4400 043f 0002 5f58 0005 7e10 2400 0004 0002 5f68 0005 7e21 a000 0001 0000 0044 0000 0000 4400 0443
1616540 0002 5f68 0000 0000 4400 0443 0002 5f78 0005 7e2a 8000 0014 ffff fffc 0000 0000 c000 0002 0000 2378 0000 0000 4400 0446
1616620 0002 5f78 0000 0000 4400 0447 0002 5f8c 0000 0000 4400 0448 0002 5f94 0000 0000 4400 0449 0002 5fa0 0000 0000 4400 044a
1616700 0002 5fb0 0000 0000 4400 044b 0002 5fc8 0000 0000 4400 044c 0002 5fdc 0000 0000 4400 044d 0002 5ff0 0000 0000 4400 044e
1616760 0002 6004 0000 0000 4400 044f 0002 6018 0000 0000 e000 0002 0000 2430 0000 0000 4400 0451 0002 6030 0005 7e34 2400 0004
1617040 0002 6040 0005 7e45 a000 0001 0000 0044 0000 0000 4400 0455 0002 6040 0000 0000 4400 0455 0002 6050 0005 7e4e 8000 0014
1617120 ffff fffc 0005 7e58 8000 0001 ffff fffb 0000 0000 c000 0002 0000 2450 0000 0000 4400 0459 0002 6050 0000 0000 4400 045a
1617200 0002 6060 0000 0000 4400 045b 0002 6074 0000 0000 4400 045c 0002 6084 0000 0000 4400 045d 0002 6090 0000 0000 4400 045e
1617260 0002 60a4 0000 0000 4400 045f 0002 60bc 0000 0000 4400 0460 0002 60d0 0000 0000 4400 0462 0002 60e8 0000 0000 4400 0463
1617340 0002 60f0 0000 0000 4400 0464 0002 60fc 0000 0000 4400 0465 0002 6114 0000 0000 4400 0466 0002 6124 0000 0000 4400 0467
1617420 0002 613c 0000 0000 e000 0002 0000 2548 0000 0000 4400 0468 0002 6148 0005 7e61 2400 0001 0002 6158 0005 7e70 a000 0001
1617500 0000 0044 0005 7e79 a000 0001 0000 0048 0005 7e89 a000 0001 0000 004c 0000 0000 4400 046e 0002 6158 0000 0000 4400 046e
1617560 0002 6170 0000 0000 4400 0473 0002 6170 0000 0000 4400 0474 0002 6180 0000 0000 4400 0475 0002 6194 0000 0000 4400 0476
1617640 0002 61a0 0000 0000 4400 0477 0002 61b8 0000 0000 4400 0478 0002 61d0 0000 0000 4400 047b 0002 61dc 0000 0000 4400 0482
1617720 0002 61f0 0000 0000 4400 0483 0002 61fc 0005 7e9d 2400 0004 0002 620c 0000 0000 4400 0486 0002 620c 0000 0000 4400 0486
1620000 0002 6218 0005 7ead 8000 0014 ffff fffc 0005 7eb7 8000 0004 ffff fff8 0005 7ebf 8000 0001 ffff fff4 0005 7ec7 8000 0001
1620060 ffff fff0 0000 0000 c000 0002 0000 2618 0000 0000 4400 048b 0002 6218 0000 0000 4400 048c 0002 6230 0000 0000 4400 048d
1620140 0002 6240 0000 0000 4400 048e 0002 6250 0000 0000 4400 048f 0002 625c 0000 0000 4400 0491 0002 6270 0000 0000 4400 0493
1620220 0002 6278 0000 0000 4400 0494 0002 627c 0000 0000 4400 0495 0002 6288 0000 0000 4400 0496 0002 62a8 0000 0000 4400 0497
1620300 0002 62bc 0000 0000 4400 0498 0002 62cc 0000 0000 4400 049a 0002 62d8 0000 0000 4400 049b 0002 62e8 0000 0000 4400 049c
1620360 0002 6308 0000 0000 4400 049d 0002 6328 0000 0000 4400 049e 0002 6348 0000 0000 4400 049f 0002 6364 0000 0000 4400 04a0
```

```
1620440  0002 6378 0000 0000 4400 04a1 0002 6388 0000 0000 4400 04a2 0002 6398 0000 0000 4400 04a3 0002 63b0 0000 0000 4400 04a4
1620520  0002 63c0 0000 0000 4400 04a5 0002 63c8 0000 0000 4400 04a6 0002 63e0 0000 0000 4400 04a7 0002 63f8 0000 0000 4400 04a4
1620600  0002 6410 0000 0000 4400 04aa 0002 6438 0000 0000 4400 04ae 0002 6444 0000 0000 4400 04af 0002 644c 0000 0000 4400 04b0
1620660  0002 6454 0000 0000 4400 04b1 0002 645c 0000 0000 4400 04b2 0002 6464 0000 0000 4400 04b3 0002 6464 0000 0000 4400 04b4
1620740  0002 64c0 0000 0000 4400 04b5 0002 64d0 0000 0000 4400 04b6 0002 64d8 0000 0000 4400 04b7 0002 64f8 0000 0000 4400 04b8
1621020  0002 6518 0000 0000 e000 0002 0000 2938 0000 0000 4400 04ba 0002 6538 0005 7ed3 0400 0000 0002 6548 0005 7edd 0600 0000
1621100  0004 1a78 0005 7ee4 0600 0000 0004 1af8 0005 7eeb 0600 0000 0004 1ab8 0005 7ef6 0600 0000 0004 1a38 0005 7ef1 0600 0000
1621160  0004 1b34 0005 7f06 6400 0000 0002 6548 0005 7f23 6400 0000 0002 6548 0005 7f37 8000 0000 0000 0000 0005 7f61 8000 0000
1621240  0000 0000 0005 7f7b 8000 0000 0000 0000 0005 7fa6 8000 0000 0000 0000 0005 7fc8 8000 0000 0000 0000 0005 7feb 8000 0000
1621320  0000 0000 0005 8011 8000 0000 0000 0000 0005 8033 8000 0000 0000 0000 0005 8054 8000 0000 0000 0000 0005 806d 8000 0000
1621400  0000 0000 0005 8088 8000 0000 0000 0000 0005 809c 8000 0000 0000 0000 0005 80ae 2600 0001 0004 1a38 0005 80cf c200 0000
1621460  0000 03a3 0005 80e6 8200 0000 0000 170e 0005 8108 8400 0000 0002 6548 0005 812a 2600 0001 0004 1a78 0005 814a 8000 0004
1621540  ffff fb05 0005 815e 8000 0004 ffff fb05 0000 0000 a200 0000 0000 0000 0005 816d 8200 0000 0000 1a14 0005 8179 8400 0000
1621620  0002 6548 0005 8185 2600 0001 0004 1ab8 0005 8196 8200 0000 0000 252e 0005 81b8 8400 0000 0002 6548 0005 81da 2600 0001
1621700  0004 1af8 0005 81fa 8000 0001 ffff fb05 0005 827c 8000 0004 ffff fb05 0005 82ac 8000 0004 ffff fb05 0000 0000 a200 0000
1621760  0000 0000 0005 82cc 2000 0004 0000 0000 0005 82e1 2000 0004 0000 0000 0005 82f1 2000 0004 0000 0000 0000 0000 a200 0000
1622040  0000 0000 0005 8310 2000 0004 0000 0000 0005 8328 2600 0004 0004 1b34 0005 8337 8400 0000 0002 6548 0005 8341 2400 0004
1622120  0002 6548 0005 8358 a000 0004 0000 0044 0005 8369 a000 0001 0000 0048 0000 0000 4400 0017 0002 6548 0000 0000 4400 0017
1622200  0002 655c 0005 8375 2000 0004 0000 0000 0000 0000 c000 0002 0000 0014 0000 0000 4400 001a 0002 655c 0000 0000 4400 001b
1622260  0002 6580 0000 0000 4400 001d 0002 65a0 0000 0000 e000 0002 0000 0068 0000 0000 4400 001e 0002 65b0 0005 838b 2400 0004
1622340  0002 65c0 0005 839a a000 0004 0000 0044 0000 0000 4400 0023 0002 65c0 0000 0000 4400 0023 0002 65d0 0000 0000 4400 0024
1622420  0002 65d0 0000 0000 4400 0026 0002 65e4 0000 0000 4400 0027 0002 65f4 0000 0000 4400 0029 0002 6600 0000 0000 4400 002a
1622500  0002 6610 0000 0000 4400 002b 0002 6620 0000 0000 4400 002c 0002 6630 0005 83a6 2400 0004 0002 6640 0005 83b4 a000 0004
1622560  0000 0044 0000 0000 4400 0030 0002 6640 0000 0000 4400 0030 0002 6650 0000 0000 4400 0031 0002 6650 0000 0000 4400 0032
1622640  0002 6670 0000 0000 4400 0033 0002 667c 0000 0000 4400 0034 0002 6684 0005 83c1 2400 0001 0002 6694 0005 83d0 a000 0004
1622720  0000 0044 0005 83dc a000 0004 0000 0048 0000 0000 4400 0039 0002 6694 0000 0000 4400 0039 0002 66a8 0005 83e9 8000 0001
1623000  ffff fffc 0000 0000 c000 0002 0000 0160 0000 0000 4400 003c 0002 66a8 0000 0000 4400 003d 0002 66b4 0000 0000 4400 003e
1623060  0002 66c4 0000 0000 4400 003f 0002 66cc 0000 0000 4400 0040 0002 66e4 0000 0000 4400 0041 0002 66f4 0000 0000 e000 0002
1623140  0000 01b8 0000 0000 4400 0042 0002 6700 0005 83f3 2400 0001 0002 6710 0005 8401 a000 0004 0000 0044 0005 840d a000 0004
1623220  0000 0048 0000 0000 4400 0047 0002 6710 0000 0000 4400 0047 0002 6724 0005 841a 8000 0001 ffff fffc 0000 0000 c000 0002
1623300  0000 01dc 0000 0000 4400 004a 0002 6724 0000 0000 4400 004b 0002 6730 0000 0000 4400 004c 0002 6740 0000 0000 4400 004d
1623360  0002 6748 0000 0000 4400 004e 0002 6760 0000 0000 4400 004f 0002 6770 0000 0000 e000 0002 0000 0234 0000 0000 4400 0050
1623440  0002 677c 0005 8424 2400 0004 0002 678c 0000 0000 4400 0053 0002 678c 0000 0000 4400 0053 0002 6798 0000 0000 4400 0054
1623520  0002 6798 0000 0000 4400 0055 0002 67a0 0005 843c c400 0000 0002 67b0 0005 8446 0400 0000 0002 70b0 0005 8450 0800 0000
1623600  0004 aec8 0005 8456 0800 0000 0004 aedc 0005 8460 0800 0000 0004 aed8 0005 8467 0800 0000 0004 aec4 0005 8471 0800 0000
1623660  0004 aec0 0005 847c 0600 0000 0004 1bc8 0005 8483 0600 0000 0004 1c04 0005 848e 0600 0000 0004 1b88 0005 8499 0400 0000
1623740  0002 6e3c 0005 84a4 0600 0000 0004 1b48 0005 84ab 0800 0000 0004 aed4 0005 84b4 0800 0000 0004 aecc 0005 84b9 0800 0000
1624020  0004 aed0 0005 84c1 6400 0000 0002 67b0 0005 84e8 6400 0000 0002 67b0 0005 84f2 8000 0000 0000 0000 0005 851c 8000 0000
1624100  0000 0000 0005 8536 8000 0000 0000 0000 0005 8561 8000 0000 0000 0000 0005 8583 8000 0000 0000 0000 0005 85a6 8000 0000
1624160  0000 0000 0005 85cc 8000 0000 0000 0000 0005 85ee 8000 0000 0000 0000 0005 860f 8000 0000 0000 0000 0005 8628 8000 0000
1624240  0000 0000 0005 8643 8000 0000 0000 0000 0005 8657 8000 0000 0000 0000 0005 8669 2600 0001 0004 1b48 0005 868a c200 0000
1624320  0000 0ff2 0005 869f 8200 0000 0000 1b24 0005 86ab 8400 0000 0002 67b0 0005 86b7 2600 0001 0004 1b88 0005 86db 8200 0000
1624400  0000 2882 0005 86fd 8400 0000 0002 67b0 0005 871f 2600 0001 0004 1bc8 0005 873f 8000 0001 ffff fb05 0005 87c1 8000 0004
1624460  ffff fb05 0005 87d0 8000 0004 ffff fb05 0005 8800 8000 0004 ffff fb05 0000 0000 a200 0000 0000 0000 0005 8820 2000 0004
1624540  0000 0000 0005 8835 2000 0004 0000 0000 0005 8845 2000 0004 0000 0000 0000 0000 a200 0000 0000 0000 0005 8864 8200 0000
1624620  0000 0bf9 0005 8870 0400 0000 0002 67b0 0005 887c 2600 0001 0004 1c04 0005 888d c200 0000 0000 0000 0005 8899 c200 0000
1624700  0000 07e7 0005 88bb 8000 0004 ffff fb05 0000 0000 a200 0000 0000 0000 0005 88cd 8000 0001 ffff fb05 0005 88e3 8000 0008
1624760  ffff fb05 0005 8917 8000 0008 ffff fb05 0005 892c 2800 0004 0004 aec0 0005 893d 2800 0004 0004 aec4 0005 894d 2800 0004
1625040  0004 aec8 0005 8959 2800 0004 0004 aecc 0005 8964 2800 0008 0004 aed0 0005 8973 2800 0004 0004 aed4 0005 8982 2800 0004
1625120  0004 aed8 0005 898f 2800 0004 0004 aedc 0005 89a0 2400 0004 0002 67b0 0005 89af a000 0008 0000 0044 0005 89bc a000 0004
1625200  0000 0048 0005 89c9 a000 0004 0000 004c 0005 89da 8400 0000 0002 67b0 0000 0000 4400 0046 0002 67b0 0000 0000 4400 0046
1625260  0002 67c8 0005 89e4 8000 0004 ffff fffc 0005 89f0 8000 0004 ffff fff8 0005 89f9 8000 0004 ffff fff4 0005 8a05 8000 0008
1625340  ffff fff0 0005 8a10 8000 0008 ffff ffec 0005 8a1c 8000 0008 ffff ffe8 0005 8a28 8000 0008 ffff ffe4 0005 8a31 8000 0008
1625420  ffff ffe0 0005 8a3a 8000 0001 ffff ffdc 0000 0000 c000 0002 0000 0018 0000 0000 4400 004b 0002 67c8 0000 0000 4400 004c
1625500  0002 67dc 0000 0000 4400 004d 0002 6d1c 0000 0000 4400 004e 0002 682c 0000 0000 4400 004f 0002 6844 0000 0000 4400 0050
```

| | | | | | | | | | | | | | | | | | | | | | | | | |
|---|---|---|---|---|---|---|---|---|---|---|---|---|---|---|---|---|---|---|---|---|---|---|---|---|
| 1625560 | 0002 | 6860 | 0000 | 0000 | 4400 | 0051 | 0002 | 6874 | 0000 | 0000 | 4400 | 0052 | 0002 | 68a0 | 0000 | 0000 | 4400 | 0053 | 0002 | 68d8 | 0000 | 0000 | 4400 | 0054 |
| 1625640 | 0002 | 6900 | 0000 | 0000 | 4400 | 0055 | 0002 | 690c | 0000 | 0000 | 4400 | 0056 | 0002 | 691c | 0000 | 0000 | 4400 | 0057 | 0002 | 6928 | 0000 | 0000 | 4400 | 0058 |
| 1625720 | 0002 | 6934 | 0000 | 0000 | 4400 | 0059 | 0002 | 6944 | 0000 | 0000 | 4400 | 0052 | 0002 | 6950 | 0000 | 0000 | 4400 | 004f | 0002 | 6970 | 0000 | 0000 | 4400 | 004e |
| 1626000 | 0002 | 6980 | 0000 | 0000 | 4400 | 004d | 0002 | 6994 | 0000 | 0000 | e000 | 0002 | 0000 | 01f8 | 0000 | 0000 | 4400 | 005f | 0002 | 69a8 | 0005 | 8a45 | 2400 | 0004 |
| 1626060 | 0002 | 69b8 | 0005 | 8a57 | a000 | 0008 | 0000 | 0044 | 0005 | 8a64 | a000 | 0004 | 0000 | 0048 | 0000 | 0000 | 4400 | 0066 | 0002 | 69b8 | 0000 | 0000 | 4400 | 0066 |
| 1626140 | 0002 | 69cc | 0005 | 8a71 | 8000 | 0004 | ffff | fffc | 0005 | 8a7d | 8000 | 0004 | ffff | fff8 | 0005 | 8a86 | 8000 | 0004 | ffff | fff4 | 0005 | 8a92 | 8000 | 0008 |
| 1626220 | ffff | fff0 | 0005 | 8a9d | 8000 | 0008 | ffff | ffec | 0005 | 8aa9 | 8000 | 0008 | ffff | ffe8 | 0005 | 8ab5 | 8000 | 0008 | ffff | ffe4 | 0005 | 8abe | 8000 | 0008 |
| 1626300 | ffff | ffe0 | 0005 | 8ac7 | 8000 | 0001 | ffff | ffdc | 0005 | 8ad2 | 8000 | 0001 | ffff | ffd8 | 0005 | 8ade | 8000 | 0001 | ffff | ffd4 | 0000 | 0000 | c000 | 0002 |
| 1626360 | 0000 | 021c | 0000 | 0000 | 4400 | 006c | 0002 | 69cc | 0000 | 0000 | 4400 | 006d | 0002 | 69e0 | 0000 | 0000 | 4400 | 006e | 0002 | 6a20 | 0000 | 0000 | 4400 | 006f |
| 1626440 | 0002 | 6a30 | 0000 | 0000 | 4400 | 0070 | 0002 | 6a48 | 0000 | 0000 | 4400 | 0071 | 0002 | 6a64 | 0000 | 0000 | 4400 | 0072 | 0002 | 6a78 | 0000 | 0000 | 4400 | 0073 |
| 1626520 | 0002 | 6aa4 | 0000 | 0000 | 4400 | 0074 | 0002 | 6adc | 0000 | 0000 | 4400 | 0075 | 0002 | 6ae8 | 0000 | 0000 | 4400 | 0076 | 0002 | 6af4 | 0000 | 0000 | 4400 | 0077 |
| 1626600 | 0002 | 6b48 | 0000 | 0000 | 4400 | 0078 | 0002 | 6b64 | 0000 | 0000 | 4400 | 0079 | 0002 | 6b70 | 0000 | 0000 | 4400 | 007a | 0002 | 6b80 | 0000 | 0000 | 4400 | 007b |
| 1626660 | 0002 | 6b8c | 0000 | 0000 | 4400 | 007c | 0002 | 6b98 | 0000 | 0000 | 4400 | 007d | 0002 | 6ba8 | 0000 | 0000 | 4400 | 0073 | 0002 | 6bb4 | 0000 | 0000 | 4400 | 0070 |
| 1626740 | 0002 | 6bd4 | 0000 | 0000 | 4400 | 006f | 0002 | 6be4 | 0000 | 0000 | 4400 | 006e | 0002 | 6bf8 | 0000 | 0000 | e000 | 0002 | 0000 | 045c | 0000 | 0000 | 4400 | 0083 |
| 1627020 | 0002 | 6c0c | 0005 | 8aeb | 2400 | 0004 | 0002 | 6c1c | 0005 | 8aff | a000 | 0001 | 0000 | 0044 | 0005 | 8b09 | a000 | 0001 | 0000 | 0048 | 0005 | 8b13 | a000 | 0004 |
| 1627100 | 0000 | 004c | 0000 | 0000 | 4400 | 0088 | 0002 | 6c1c | 0000 | 0000 | 4400 | 0088 | 0002 | 6c34 | 0000 | 0000 | 4400 | 0089 | 0002 | 6c34 | 0000 | 0000 | 4400 | 008a |
| 1627160 | 0002 | 6c48 | 0005 | 8b1d | 2400 | 0004 | 0002 | 6c58 | 0005 | 8b2f | a000 | 0001 | 0000 | 0044 | 0005 | 8b3d | a000 | 0001 | 0000 | 0048 | 0005 | 8b4a | a000 | 0004 |
| 1627240 | 0000 | 004c | 0000 | 0000 | 4400 | 0099 | 0002 | 6c58 | 0000 | 0000 | 4400 | 0090 | 0002 | 6c70 | 0005 | 8b58 | 8000 | 0001 | ffff | fffc | 0005 | 8b64 | 8000 | 0004 |
| 1627320 | ffff | fff8 | 0000 | 0000 | c000 | 0002 | 0000 | 04c0 | 0000 | 0000 | 4400 | 0094 | 0002 | 6c70 | 0000 | 0000 | 4400 | 0095 | 0002 | 6c90 | 0000 | 0000 | 4400 | 0096 |
| 1627400 | 0002 | 6ca4 | 0000 | 0000 | 4400 | 0097 | 0002 | 6cc0 | 0000 | 0000 | 4400 | 0098 | 0002 | 6cd8 | 0000 | 0000 | 4400 | 0097 | 0002 | 6cf0 | 0000 | 0000 | 4400 | 0099 |
| 1627460 | 0002 | 6d04 | 0000 | 0000 | 4400 | 009b | 0002 | 6d18 | 0000 | 0000 | 4400 | 009d | 0002 | 6d20 | 0000 | 0000 | 4400 | 009e | 0002 | 6d3c | 0000 | 0000 | e000 | 0002 |
| 1627540 | 0000 | 05a0 | 0000 | 0000 | 4400 | 009f | 0002 | 6d50 | 0005 | 8b6c | 2400 | 0008 | 0002 | 6d60 | 0005 | 8b7d | a000 | 0004 | 0000 | 0044 | 0005 | 8b8a | a000 | 0004 |
| 1627620 | 0000 | 0048 | 0005 | 8b94 | a000 | 0004 | 0000 | 004c | 0000 | 0000 | 4400 | 00a7 | 0002 | 6d60 | 0000 | 0000 | 4400 | 00a7 | 0002 | 6d78 | 0000 | 0000 | 4400 | 00a8 |
| 1627700 | 0002 | 6d78 | 0000 | 0000 | 4400 | 00a9 | 0002 | 6d80 | 0000 | 0000 | 4400 | 00aa | 0002 | 6d94 | 0000 | 0000 | 4400 | 00ab | 0002 | 6db8 | 0000 | 0000 | 4400 | 00ac |
| 1627760 | 0002 | 6dc4 | 0000 | 0000 | 4400 | 00ad | 0002 | 6dcc | 0000 | 0000 | 4400 | 00ae | 0002 | 6dd8 | 0000 | 0000 | 4400 | 00af | 0002 | 6dec | 0000 | 0000 | 4400 | 00b0 |
| 1630040 | 0002 | 6e04 | 0000 | 0000 | 4400 | 00b1 | 0002 | 6e1c | 0000 | 0000 | 4400 | 00b2 | 0002 | 6e2c | 0005 | 8ba8 | 2400 | 0001 | 0002 | 6e3c | 0005 | 8bb9 | a000 | 0001 |
| 1630120 | 0000 | 0044 | 0005 | 8bc5 | a000 | 0004 | 0000 | 0048 | 0000 | 0000 | 4400 | 00b9 | 0002 | 6e3c | 0000 | 0000 | 4400 | 00b9 | 0002 | 6e50 | 0005 | 8bd3 | 8000 | 0004 |
| 1630200 | ffff | fffc | 0005 | 8bdb | 8000 | 0004 | ffff | fff8 | 0005 | 8be6 | 8000 | 0001 | ffff | fff4 | 0005 | 8bf0 | 8000 | 0001 | ffff | fff0 | 0005 | 8bfc | 8000 | 0001 |
| 1630260 | ffff | ffec | 0005 | 8c07 | 8000 | 0001 | ffff | ffe8 | 0000 | 0000 | c000 | 0002 | 0000 | 06a0 | 0000 | 0000 | 4400 | 00bd | 0002 | 6e50 | 0000 | 0000 | 4400 | 00be |
| 1630340 | 0002 | 6e60 | 0000 | 0000 | 4400 | 00bf | 0002 | 6e6c | 0000 | 0000 | 4400 | 00c0 | 0002 | 6e78 | 0000 | 0000 | 4400 | 00c1 | 0002 | 6ec4 | 0000 | 0000 | 4400 | 00c2 |
| 1630420 | 0002 | 6ed8 | 0000 | 0000 | 4400 | 00c3 | 0002 | 6ee8 | 0000 | 0000 | 4400 | 00c4 | 0002 | 6efc | 0000 | 0000 | 4400 | 00c5 | 0002 | 6f18 | 0000 | 0000 | 4400 | 00c6 |
| 1630500 | 0002 | 6f54 | 0000 | 0000 | 4400 | 00c7 | 0002 | 6f5c | 0000 | 0000 | 4400 | 00c9 | 0002 | 6f78 | 0000 | 0000 | 4400 | 00ca | 0002 | 6f80 | 0000 | 0000 | 4400 | 00cc |
| 1630560 | 0002 | 6f94 | 0000 | 0000 | 4400 | 00cd | 0002 | 6fa8 | 0000 | 0000 | 4400 | 00ce | 0002 | 6fc8 | 0000 | 0000 | 4400 | 00cf | 0002 | 7004 | 0000 | 0000 | 4400 | 00d0 |
| 1630640 | 0002 | 7010 | 0000 | 0000 | 4400 | 00d2 | 0002 | 702c | 0000 | 0000 | 4400 | 00d3 | 0002 | 7038 | 0000 | 0000 | 4400 | 00d5 | 0002 | 704c | 0000 | 0000 | 4400 | 00d7 |
| 1630720 | 0002 | 706c | 0000 | 0000 | 4400 | 00d8 | 0002 | 7094 | 0000 | 0000 | e000 | 0002 | 0000 | 08f0 | 0000 | 0000 | 4400 | 00d9 | 0002 | 70a0 | 0005 | 8c12 | 2400 | 0001 |
| 1631000 | 0002 | 70b0 | 0005 | 8c22 | a000 | 0001 | 0000 | 0044 | 0005 | 8c2e | a000 | 0004 | 0000 | 0048 | 0000 | 0000 | 4400 | 00de | 0002 | 70b0 | 0000 | 0000 | 4400 | 00de |
| 1631060 | 0002 | 70c4 | 0005 | 8c3c | 8000 | 0004 | ffff | fffc | 0005 | 8c44 | 8000 | 0004 | ffff | fff8 | 0005 | 8c4f | 8000 | 0001 | ffff | fff4 | 0005 | 8c59 | 8000 | 0001 |
| 1631140 | ffff | fff0 | 0005 | 8c65 | 8000 | 0001 | ffff | ffec | 0005 | 8c70 | 8000 | 0001 | ffff | ffe8 | 0000 | 0000 | c000 | 0002 | 0000 | 0914 | 0000 | 0000 | 4400 | 00e2 |
| 1631220 | 0002 | 70c4 | 0000 | 0000 | 4400 | 00e3 | 0002 | 70d4 | 0000 | 0000 | 4400 | 00e4 | 0002 | 70e0 | 0000 | 0000 | 4400 | 00e5 | 0002 | 70ec | 0000 | 0000 | 4400 | 00e6 |
| 1631300 | 0002 | 7138 | 0000 | 0000 | 4400 | 00e7 | 0002 | 714c | 0000 | 0000 | 4400 | 00e8 | 0002 | 715c | 0000 | 0000 | 4400 | 00e9 | 0002 | 7170 | 0000 | 0000 | 4400 | 00ea |
| 1631360 | 0002 | 718c | 0000 | 0000 | 4400 | 00eb | 0002 | 71b0 | 0000 | 0000 | 4400 | 00ec | 0002 | 71b8 | 0000 | 0000 | 4400 | 00ee | 0002 | 71d4 | 0000 | 0000 | 4400 | 00ef |
| 1631440 | 0002 | 71dc | 0000 | 0000 | 4400 | 00f1 | 0002 | 71f0 | 0000 | 0000 | 4400 | 00f2 | 0002 | 7204 | 0000 | 0000 | 4400 | 00f3 | 0002 | 7224 | 0000 | 0000 | 4400 | 00f4 |
| 1631520 | 0002 | 7248 | 0000 | 0000 | 4400 | 00f5 | 0002 | 7254 | 0000 | 0000 | 4400 | 00f7 | 0002 | 7270 | 0000 | 0000 | 4400 | 00f8 | 0002 | 727c | 0000 | 0000 | 4400 | 00fa |
| 1631600 | 0002 | 7290 | 0000 | 0000 | 4400 | 00fc | 0002 | 72b0 | 0000 | 0000 | 4400 | 00fd | 0002 | 72d8 | 0000 | 0000 | e000 | 0002 | 0000 | 0b34 | 0000 | 0000 | 4400 | 00fe |
| 1631660 | 0002 | 72e4 | 0005 | 8c7b | 2400 | 0001 | 0002 | 72f4 | 0005 | 8c8b | a000 | 0001 | 0000 | 0044 | 0005 | 8c97 | a000 | 0001 | 0000 | 0048 | 0005 | 8ca6 | a000 | 0001 |
| 1631740 | 0000 | 004c | 0005 | 8cb4 | a000 | 0004 | 0000 | 0050 | 0000 | 0000 | 4400 | 0105 | 0002 | 72f4 | 0000 | 0000 | 4400 | 0105 | 0002 | 7310 | 0005 | 8cc5 | 8000 | 0004 |
| 1632020 | ffff | fffc | 0005 | 8cd2 | 8000 | 0001 | ffff | fff8 | 0000 | 0000 | c000 | 0002 | 0000 | 0b60 | 0000 | 0000 | 4400 | 0109 | 0002 | 7310 | 0000 | 0000 | 4400 | 010a |
| 1632100 | 0002 | 7324 | 0000 | 0000 | 4400 | 010b | 0002 | 7338 | 0000 | 0000 | 4400 | 010c | 0002 | 7344 | 0000 | 0000 | 4400 | 010e | 0002 | 7388 | 0000 | 0000 | 4400 | 010f |
| 1632160 | 0002 | 7398 | 0000 | 0000 | 4400 | 0110 | 0002 | 73b0 | 0000 | 0000 | e000 | 0002 | 0000 | 0c18 | 0000 | 0000 | 4400 | 0111 | 0002 | 73c8 | 0005 | 8cdc | 0400 | 0000 |
| 1632240 | 0002 | 73d8 | 0005 | 8ce4 | 0400 | 0000 | 0002 | 7ab0 | 0005 | 8d0d | 0400 | 0000 | 0002 | 7bbc | 0005 | 8d24 | 0400 | 0000 | 0002 | 7be8 | 0005 | 8d3b | 0400 | 0000 |
| 1632320 | 0002 | 7a4c | 0005 | 8d5b | 0400 | 0000 | 0002 | 7c6c | 0005 | 8170 | 0400 | 0000 | 0002 | 7a0c | 0005 | 8d8f | 0400 | 0000 | 0002 | 73d8 | 0005 | 8da0 | 0400 | 0000 |
| 1632400 | 0002 | 7c10 | 0005 | 8db8 | 0800 | 0000 | 0004 | aee0 | 0005 | 81c7 | 0400 | 0000 | 0002 | 79a8 | 0005 | 8de0 | 0400 | 0000 | 0002 | 7b5c | 0005 | 8dfa | 0400 | 0000 |
| 1632460 | 0002 | 7b8c | 0005 | 8e14 | 0400 | 0000 | 0002 | 7ae4 | 0005 | 8e2b | 0400 | 0000 | 0002 | 7c38 | 0005 | 8e42 | 0400 | 0000 | 0002 | 753c | 0005 | 8e53 | 0400 | 0000 |
| 1632540 | 0002 | 7c9c | 0005 | 8e6e | 6400 | 0000 | 0002 | 73d8 | 0005 | 8ea1 | 6400 | 0000 | 0002 | 73d8 | 0005 | 8ea9 | 8400 | 0000 | 0002 | 73d8 | 0005 | 8eb3 | 8000 | 0000 |
| 1632620 | 0000 | 0000 | 0005 | 8edd | 8000 | 0000 | 0000 | 0000 | 0005 | 8ef7 | 8000 | 0000 | 0000 | 0000 | 0005 | 8f22 | 8000 | 0000 | 0000 | 0000 | 0005 | 8f44 | 8000 | 0000 |

```
1632700 0000 0000 0005 8f67 8000 0000 0000 0000 0005 8f8d 8000 0000 0000 0000 0005 8faf 8000 0000 0000 0000 0005 8fd0 8000 0000
1632760 0000 0000 0005 8fe9 8000 0000 0000 0000 0005 9004 8000 0000 0000 0000 0005 9018 8000 0000 0000 0000 0005 902a 8000 0004
1633040 ffff fb05 0005 9040 8000 0008 ffff fb05 0005 9085 8000 0001 ffff fb05 0005 90a2 8000 0004 ffff fb05 0005 90b0 2000 0004
1633120 0000 0000 0005 90bd 2000 0004 0000 0000 0005 90cd 2000 0001 0000 0000 0005 90ec 2000 0004 0000 0000 0005 90f7 2000 0004
1633200 0000 0000 0005 9104 2000 0004 0000 0000 0005 9111 2000 0001 0000 0000 0005 9120 2000 0004 0000 0000 0005 912e 2000 0004
1633260 0000 0000 0005 913c 8000 0004 ffff fb05 0005 914d 8000 0004 ffff fb05 0005 915b 8000 0004 ffff fb05 0005 916c 8000 0004
1633340 ffff fb05 0005 917d 8000 0004 ffff fb05 0005 91f4 8000 0004 ffff fb05 0005 928c 8000 0004 ffff fb05 0005 92d0 8000 0004
1633420 ffff fb05 0005 9350 8000 0004 ffff fb05 0005 93ca 8000 0004 ffff fb05 0005 93f8 8000 003c ffff fb05 0005 950f 8000 003c
1633500 ffff fb05 0005 960b 2000 0004 0000 0000 0005 9622 2000 0004 0000 0000 0005 963b 2000 0004 0000 0000 0005 9653 2000 0004
1633560 0000 0000 0005 9668 2000 0004 0000 0000 0005 967e 2000 0001 0000 0000 0005 9697 8000 0000 0000 0000 0005 975d 8000 0000
1633640 0000 0000 0005 9823 8000 0000 0000 0000 0005 99e3 8000 0000 0000 0000 0005 9937 8000 0028 ffff fb05 0005 9a51 8000 0028
1633720 ffff fb05 0005 9ab6 8000 0000 0000 0000 0005 9b81 8000 0000 0000 0000 0005 9c4c 8000 0000 0000 0000 0005 9d0a 8000 0000
1634000 0000 0000 0005 9dce 8000 0000 0000 0000 0005 9e93 8000 0000 0000 0000 0005 9ef2 8000 0048 ffff fb05 0005 9f70 8000 0000
1634060 0000 0000 0005 a034 8000 0000 0000 0000 0005 a0fe 8000 0000 0000 0000 0005 a1d3 8000 0000 0000 0000 0005 a29f 8000 0000
1634140 0000 0000 0005 a33d 8000 0044 ffff fb05 0005 a394 8000 0000 0000 0000 0005 a45a 8000 0000 0000 0000 0005 a525 8000 0000
1634220 0000 0000 0005 a5f2 8000 0000 0000 0000 0005 a634 2400 0044 0002 73d8 0005 a654 a000 0044 0000 0044 0005 a664 a000 0001
1634300 0000 0048 0005 a670 8400 0000 0002 73d8 0000 0000 4400 01d1 0002 73d8 0005 a68d 4000 0044 0000 0018 0000 0000 4400 01d1
1634360 0002 73e8 0005 a69d 8000 0000 0000 0000 0005 a6aa 8000 0000 0000 0000 0000 0000 4400 01d2 0002 73e8 0000 0000 4400 01d3
1634440 0002 741c 0000 0000 4400 01d4 0002 74c0 0000 0000 4400 01d6 0002 74f0 0000 0000 4400 01d8 0002 7520 0000 0000 4400 01d9
1634520 0002 752c 0005 a6b4 8000 0000 0000 0000 0005 a6c9 8000 0050 ffff fb05 0005 a744 8000 0000 0000 0000 0005 a7cb 2000 0000
1634600 0000 0000 0005 a7ed 2000 0000 0000 0000 0005 a810 2000 0000 0000 0000 0005 a81d 2000 0000 0000 0000 0005 a82a 8000 0001
1634660 ffff fb05 0005 ad64 2000 0004 0000 0000 0005 a886 2000 0004 0000 0000 0005 a8a8 8000 0000 0000 0000 0005 a935 2800 0001
1634740 0004 aee0 0005 a94b 8000 0004 ffff fb05 0005 a957 8000 0008 ffff fb05 0005 a9ba 8000 0000 0000 0000 0005 aa36 8000 0004
1635020 ffff fb05 0005 aa6b 8000 0000 0000 0000 0005 aabf 8000 0008 ffff fb05 0005 ab2a 8000 0000 0000 0000 0005 ab90 8000 0004
1635100 ffff fb05 0005 abc5 8000 0000 0000 0000 0005 ac21 8000 0008 ffff fb05 0005 ac84 8000 0000 0000 0000 0005 acea 8000 0004
1635160 ffff fb05 0005 ad1f 8000 0000 0000 0000 0005 a17b 8000 0008 ffff fb05 0005 ade9 8000 0000 0000 0000 0005 ae76 8000 0004
1635240 ffff fb05 0005 aead 8000 0000 0000 0000 0005 af0f 8000 0008 ffff fb05 0005 af65 8000 0000 0000 0000 0005 afe6 8000 0004
1635320 ffff fb05 0005 b01d 8000 0000 0000 0000 0005 b075 8000 0008 ffff fb05 0005 b0cb 8000 0000 0000 0000 0005 b135 8000 0004
1635400 ffff fb05 0005 b16c 8000 0000 0000 0000 0005 b1cc 8000 0008 ffff fb05 0005 b222 8000 0000 0000 0000 0005 b28c 8000 0004
1635460 ffff fb05 0005 b2c3 8000 0000 0000 0000 0005 b323 8000 0008 ffff fb05 0005 b37c 8000 0000 0000 0000 0005 b40e 8000 0004
1635540 ffff fb05 0005 b447 8000 0000 0000 0000 0005 b4a1 8000 0034 ffff fb05 0005 b5c6 8000 0034 ffff fb05 0005 b6a8 8000 0000
1635620 0000 0000 0005 b772 8000 0000 0000 0000 0005 b79f 8000 0040 ffff fb05 0005 b8b7 8000 0040 ffff fb05 0005 b9d1 2000 0004
1635700 0000 0000 0005 b9eb 8000 0000 0000 0000 0005 bab8 8000 0000 0000 0000 0005 bb63 8000 0084 ffff fb05 0005 bbe8 8000 0000
1635760 0000 0000 0005 bcb3 8000 0000 0000 0000 0005 bd39 8000 0004 ffff fb05 0005 bd4d 8000 0004 ffff fb05 0005 bd89 8000 0004
1636040 ffff fb05 0005 bdca 8000 0004 ffff fb05 0005 be08 8000 0004 ffff fb05 0005 be43 8000 0004 ffff fb05 0005 be81 8000 0004
1636120 ffff fb05 0005 bea3 8000 0004 ffff fb05 0005 bec5 2000 0001 0000 0000 0005 bed4 8000 0004 ffff fb05 0005 bf03 8000 0000
1636200 0000 0000 0005 bf88 2000 0008 0000 0000 0005 bfab 8000 0008 ffff fb05 0005 bfb6 8000 0008 ffff fb05 0005 bfc2 8000 0008
1636260 ffff fb05 0005 bfce 8000 0008 ffff fb05 0005 c01a 8000 0000 0000 0000 0005 c0e0 8000 0000 0000 0000 0005 c142 8000 0044
1636340 ffff fb05 0005 c1a4 8000 0000 0000 0000 0005 c26a 8000 0000 0000 0000 0005 c295 8000 0008 ffff fb05 0005 c2a1 8000 000c
1636420 ffff fb05 0005 c314 8000 0000 0000 0000 0005 c3a0 8000 0008 ffff fb05 0005 c3f4 8000 0000 0000 0000 0005 c474 8000 000c
1636500 ffff fb05 0005 c4ea 8000 0000 0000 0000 0005 c595 2000 0008 0000 0000 0005 c5ba 8000 000c ffff fb05 0005 c61e 8000 0000
1636560 0000 0000 0005 c6df 8000 0000 0000 0000 0005 c74f 2000 0008 0000 0000 0005 c770 8000 000c ffff fb05 0005 c7d5 8000 0000
1636640 0000 0000 0005 c9a3 8000 0000 0000 0000 0005 c911 2000 0008 0000 0000 0005 c933 8000 0008 ffff fb05 0005 c994 8000 0000
1636720 0000 0000 0005 ca3b 8000 0010 ffff fb05 0005 cacb 8000 0000 0000 0000 0005 cb7c 8000 0018 ffff fb05 0005 cc0c 8000 0000
1637000 0000 0000 0005 ccdc 4000 0000 0000 0000 0005 cd64 2000 0008 0000 0000 0005 cd87 8000 0024 ffff fb05 0005 ced4 8000 0000
1637060 0000 0000 0005 cf94 8000 0000 0000 0000 0005 d028 8000 0004 ffff fb05 0005 d071 8000 0000 0000 0000 0005 d084 8000 0010
1637140 ffff fb05 0005 d10d 8000 0000 0000 0000 0005 d1d1 8000 0000 0000 0000 0005 d290 8000 0000 0000 0000 0005 d2a7 2000 0008
1637220 0000 0000 0005 d2cc 8000 003c ffff fb05 0005 d3d4 8000 003c ffff fb05 0005 d45f 8000 0000 0000 0000 0005 d522 8000 0000
1637300 0000 0000 0005 d5f4 8000 0000 0000 0000 0005 d6bf 8000 0000 0000 0000 0005 d79b 8000 0000 0000 0000 0005 d875 8000 0000
1637360 0000 0000 0005 d93c 8000 0000 0000 0000 0005 d98a 2000 0008 0000 0000 0005 d9b0 8000 001c ffff fb05 0005 da54 8000 0000
1637440 0000 0000 0005 db2c 8000 0000 0000 0000 0005 dc00 8000 0000 0000 0000 0005 dcd6 8000 0000 0000 0000 0005 dcf9 2000 0008
1637520 0000 0000 0005 dd27 8000 003c ffff fb05 0005 de28 8000 003c ffff fb05 0005 de8d 8000 0000 0000 0000 0005 df53 8000 0000
1637600 0000 0000 0005 e010 8000 0000 0000 0000 0005 e0a3 2000 0008 0000 0000 0005 e0c6 8000 008c ffff fb05 0005 e1c1 8000 008c
1637660 ffff fb05 0005 e267 8000 0000 0000 0000 0005 e334 8000 0000 0000 0000 0005 e3f1 8000 0000 0000 0000 0005 e4c0 8000 0000
1637740 0000 0000 0005 e546 2000 0008 0000 0000 0005 e568 2400 003c 0002 753c 0005 e589 a000 003c 0000 0044 0005 e59a 8400 0000
```

```
1640020  0002 753c 0000 0000 4400 0010 0002 753c 0005 e5ce 4000 003c 0000 0018 0000 0000 4400 0010 0002 7548 0005 e5df 8000 0000
1640100  0000 0000 0000 0000 4400 000f 0002 7548 0000 0000 4400 0010 0002 7650 0000 0000 4400 0011 0002 7654 0000 0000 4400 0012
1640160  0002 7658 0000 0000 4400 0010 0002 765c 0000 0000 4400 0028 0002 7670 0000 0000 4400 0029 0002 767c 0005 e5ec 8000 0000
1640240  0000 0000 0005 e601 8000 0034 ffff fb05 0005 e753 8000 0000 0000 0000 0005 e814 8000 0000 0000 0000 0005 e8d5 8000 0000
1640320  0000 0000 0005 e98d 2000 0008 0000 0000 0005 e9b5 8000 0018 ffff fb05 0005 ea48 8000 0000 0000 0000 0005 eb10 8000 0000
1640400  0000 0000 0005 eb46 2000 0008 0000 0000 0005 eb6b 8000 002c ffff fb05 0005 ec20 8000 0000 0000 0000 0005 ecf3 8000 0000
1640460  0000 0000 0005 e17f 2000 0008 0000 0000 0005 e1a5 8000 000c ffff fb05 0005 ee33 8000 0000 0000 0000 0005 ef02 6000 0000
1640540  0000 0000 0005 ef20 8000 002c ffff fb05 0005 f043 8000 0000 0000 0000 0005 f10f 8000 0000 0000 0000 0005 f113 2000 0008
1640620  0000 0000 0005 f135 2000 0001 0000 0000 0005 f144 2000 000c 0000 0000 0005 f159 2400 0001 0002 768c 0005 f173 a000 002c
1640700  0000 0044 0005 f18d 8400 0000 0002 768c 0000 0000 4400 0018 0002 768c 0005 f197 4000 002c 0000 0018 0000 0000 4400 0018
1640760  0002 7698 0005 f1a8 8000 0004 ffff fffc 0000 0000 c000 0002 0000 02c0 0005 f1bf 8000 0000 0000 0000 0000 0000 4400 0019
1641040  0002 7698 0000 0000 4400 001a 0002 7698 0000 0000 4400 001b 0002 76a0 0000 0000 4400 001c 0002 76c0 0000 0000 4400 001d
1641120  0002 76d0 0000 0000 4400 001e 0002 76f0 0000 0000 4400 001f 0002 7700 0000 0000 4400 0020 0002 7720 0000 0000 4400 0021
1641200  0002 7730 0000 0000 4400 0022 0002 7750 0000 0000 4400 0024 0002 7760 0000 0000 4400 0025 0002 7780 0000 0000 e000 0002
1641260  0000 03b8 0000 0000 4400 0027 0002 7790 0005 f1cc 8000 0000 0000 0000 0005 f1e4 2400 0001 0002 77a0 0005 f20c a000 002c
1641340  0000 0044 0005 f21d a000 0008 0000 0048 0000 0000 4400 002d 0002 77a0 0005 f22a 4000 002c 0000 0018 0000 0000 4400 002d
1641420  0002 77b0 0005 f23b 8000 008c ffff fffc 0005 f251 8000 0004 ffff fff8 0000 0000 c000 0002 0000 03d8 0005 f268 8000 0000
1641500  0000 0000 0000 0000 4400 0030 0002 77b0 0005 f275 8000 0000 0000 0000 0000 0000 4400 0031 0002 77b0 0005 f27f 8000 0000
1641560  0000 0000 0000 0000 4400 0032 0002 77b0 0000 0000 4400 002e 0002 77b0 0000 0000 4400 002f 0002 77b8 0000 0000 4400 0032
1641640  0002 77d8 0000 0000 4400 0033 0002 77e8 0000 0000 4400 0034 0002 7808 0000 0000 4400 0035 0002 7828 0000 0000 4400 0038
1641720  0002 7838 0000 0000 4400 0039 0002 7840 0000 0000 4400 003a 0002 785c 0000 0000 4400 003b 0002 7878 0000 0000 4400 003c
1642000  0002 7894 0000 0000 4400 003d 0002 78b0 0000 0000 e000 0002 0000 04f4 0000 0000 4400 003e 0002 78cc 0005 f289 8000 0000
1642060  0000 0000 0005 f2af 2400 0001 0002 78dc 0005 f2dc a000 002c 0000 0044 0005 f2ed a000 0001 0000 0048 0000 0000 4400 0043
1642140  0002 78dc 0005 f2fd 4000 002c 0000 0018 0000 0000 4400 0043 0002 78ec 0005 f30e 8000 0000 0000 0000 0005 f31b 8000 0000
1642220  0000 0000 0000 0000 4400 0044 0002 78ec 0000 0000 4400 0046 0002 78f4 0000 0000 4400 0047 0002 7930 0000 0000 4400 0048
1642300  0002 793c 0005 f328 8000 0000 0000 0000 0005 f352 2400 0001 0002 794c 0005 f374 8400 0000 0002 794c 0000 0000 4400 023b
1642360  0002 794c 0000 0000 4400 023b 0002 7958 0000 0000 4400 023c 0002 7968 0005 f391 2400 0001 0002 7978 0000 0000 4400 023b
1642440  0002 7978 0000 0000 4400 023b 0002 7984 0000 0000 4400 023c 0002 7998 0005 f3b3 2000 0008 0000 0000 0005 f3de 2000 0008
1642520  0000 0000 0005 f421 2000 0008 0000 0000 0005 f45a 2400 0001 0002 79a8 0005 f479 a000 002c 0000 0044 0005 f48a a000 0001
1642600  0000 0048 0005 f497 8400 0000 0002 79a8 0000 0000 4400 0009 0002 79a8 0000 0000 4400 0009 0002 79bc 0005 f4a7 8000 0000
1642660  0000 0000 0005 f4b4 8000 0000 0000 0000 0000 0000 4400 000a 0002 79bc 0000 0000 4400 0008 0002 79bc 0000 0000 4400 0009
1642740  0002 79d0 0000 0000 4400 0008 0002 79fc 0005 f4be 800c 0000 0000 0000 0005 f4db 2400 0001 0002 7a0c 0005 f500 a000 0018
1643020  0000 0044 0005 f51a a000 0001 0000 0048 0005 f527 8400 0000 0002 7a0c 0000 0000 4400 0009 0002 7a0c 0005 f55b 4000 0018
1643100  0000 0018 0000 0000 4400 0009 0002 7a1c 0005 f56c 8000 0000 0000 0000 0005 f579 8000 0000 0000 0000 0000 0000 4400 000a
1643160  0002 7a1c 0000 0000 4400 0008 0002 7a1c 0000 0000 4400 0009 0002 7a2c 0000 0000 4400 000a 0002 7a3c 0005 f583 8000 0000
1643240  0000 0000 0005 f5a6 2400 0001 0002 7a4c 0005 f5cc a000 001c 0000 0044 0005 f5e5 a000 0001 0000 0048 0005 f5f2 8400 0000
1643320  0002 7a4c 0000 0000 4400 001c 0002 7a4c 0005 f629 4000 001c 0000 0018 0000 0000 4400 001c 0002 7a5c 0005 f63a 8000 0000
1643400  0000 0000 0005 f647 8000 0000 0000 0000 0000 0000 4400 001d 0002 7a5c 0000 0000 4400 001c 0002 7a5c 0000 0000 4400 001d
1643460  0002 7aa0 0005 f651 8000 0000 0000 0000 0005 f675 2400 0001 0002 7ab0 0005 f6a4 a000 003c 0000 0044 0005 f6b4 a000 0001
1643540  0000 0048 0005 f6c1 8400 0000 0002 7ab0 0000 0000 4400 002e 0002 7ab0 0005 f6f8 4000 003c 0000 0018 0000 0000 4400 002e
1643620  0002 7ac0 0005 f708 8000 0000 0000 0000 0005 f715 8000 0000 0000 0000 0000 0000 4400 002f 0002 7ac0 0000 0000 4400 002d
1643700  0002 7ac0 0005 f71f 8000 0000 0000 0000 0005 f74c 2400 0001 0002 7ae4 0005 f769 a000 000c 0000 0044 0005 f782 a000 0001
1643760  0000 0048 0005 f78f 8400 0000 0002 7ae4 0000 0000 4400 0012 0002 7ae4 0005 f7c3 4000 000c 0000 0018 0000 0000 4400 0012
1644040  0002 7af4 0005 f7d4 a000 0000 0000 0000 0005 f7e1 8000 0000 0000 0000 0000 0000 4400 0013 0002 7af4 0000 0000 4400 0011
1644120  0002 7af4 0000 0000 4400 0012 0002 7b18 0000 0000 4400 0013 0002 7b4c 0005 f7eb 8000 0000 0000 0000 0005 f806 2400 0004
1644200  0002 7b5c 0005 f826 a000 0008 0000 0044 0005 f836 a000 0004 0000 0048 0005 f850 8400 0000 0002 7b5c 0000 0000 4400 001b
1644260  0002 7b5c 0000 0000 4400 001b 0002 7b70 0005 f883 8000 0000 0000 0000 0005 f890 8000 0000 0000 0000 0000 0000 4400 001c
1644340  0002 7b70 0000 0000 4400 001a 0002 7b70 0005 f89e 8000 0000 0000 0000 0005 f8bc 2400 0004 0002 7b8c 0005 f8dc a000 0008
1644420  0000 0044 0005 f8ec a000 0004 0000 0048 0000 0000 4400 001a 0002 7ba0 0005 f8fe 8000 0000 0000 0000 0005 f90b 8000 0000
1644500  0000 0000 0000 0000 4400 001b 0002 7ba0 0000 0000 4400 0019 0002 7ba0 0005 f919 8000 0000 0000 0000 0005 f937 2400 0001
1644560  0002 7bbc 0005 f954 a000 0008 0000 0044 0005 f964 a000 0001 0000 0048 0005 f975 a000 0008 0000 004c 0000 0000 4400 0019
1644640  0002 7bd8 0005 f986 8000 0000 0000 0000 0005 f993 8000 0000 0000 0000 0000 0000 4400 001a 0002 7bd8 0005 f9a1 8000 0000
1644720  0000 0000 0000 0000 4400 001b 0002 7bd8 0000 0000 4400 0018 0002 7bd8 0005 f9af 8000 0000 0000 0000 0005 f9ca 2400 0001
1645000  0002 7be8 0005 f9e7 a000 0008 0000 0044 0005 f9f7 a000 0001 0000 0048 0005 fa08 a000 0004 0000 004c 0000 0000 4400 0018
1645060  0002 7c00 0005 fa18 8000 0000 0000 0000 0005 fa25 8000 0000 0000 0000 0000 0000 4400 0019 0002 7c00 0005 fa33 8000 0000
```

```
1645140 0000 0000 0000 0000 4400 001a 0002 7c00 0000 0000 4400 0017 0002 7c00 0005 fa41 8000 0000 0000 0000 0005 fa5c 2400 0001
1645220 0002 7c10 0005 fa7a a000 0008 0000 0044 0005 fa8a a000 0001 0000 0048 0005 fa9b a000 0001 0000 004c 0000 0000 4400 0017
1645300 0002 7c28 0005 faac 8000 0000 0000 0000 0005 fab9 8000 0000 0000 0000 0000 0000 4400 0018 0002 7c28 0005 fac7 8000 0000
1645360 0000 0000 0000 0000 4400 0019 0002 7c28 0000 0000 4400 0016 0002 7c28 0005 fad5 8000 0000 0000 0000 0005 faf1 2400 0001
1645440 0002 7c38 0005 fb0f a000 0008 0000 0044 0005 fb1f a000 0001 0000 0048 0005 fb30 a000 0004 0000 004c 0000 0000 4400 0016
1645520 0002 7c50 0005 fb40 8000 0000 0000 0000 0005 fb4d 8000 0000 0000 0000 0000 0000 4400 0017 0002 7c50 0005 fb5b 8000 0000
1645600 0000 0000 0000 0000 4400 0018 0002 7c50 0000 0000 4400 0015 0002 7c50 0005 fb69 8000 0000 0000 0000 0005 fb84 2400 0001
1645660 0002 7c6c 0005 fba0 a000 0008 0000 0044 0005 fbb0 a000 0004 0000 0048 0000 0000 4400 0015 0002 7c80 0005 fbc0 8000 0000
1645740 0000 0000 0005 fbcd 8000 0000 0000 0000 0000 0000 4400 0016 0002 7c80 0000 0000 4400 0014 0002 7c80 0005 fbdb 8000 0000
1646020 0000 0000 0005 fbf4 2400 0004 0002 7c9c 0005 fc15 a000 0004 0000 0044 0005 fc26 a000 0004 0000 0048 0005 fc38 8400 0000
1646100 0002 7c9c 0000 0000 4400 0015 0002 7c9c 0000 0000 4400 0015 0002 7cb0 0005 fc6a 8000 0000 0000 0000 0005 fc77 8000 0000
1646160 0000 0000 0000 0000 4400 0016 0002 7cb0 0000 0000 4400 0014 0002 7cb0 0005 fc85 8000 0000 0000 0000 0005 fca4 0400 0000
1646240 0002 7cd0 0005 fcaa 0400 0000 0002 873c 0005 fcd3 0400 0000 0002 8634 0005 fcea 0400 0000 0002 8848 0005 fd01 0400 0000
1646320 0002 8874 0005 fd18 0400 0000 0002 86d8 0005 fd38 0400 0000 0002 98f8 0005 fd4d 0400 0000 0002 8698 0005 fd6c 0400 0000
1646400 0002 7cd0 0005 fd7d 0400 0000 0002 889c 0005 fd95 0800 0000 0004 aee8 0005 fda4 0400 0000 0002 87e8 0005 fdbe 0400 0000
1646460 0002 8818 0005 fdd8 0400 0000 0002 8770 0005 fdef 0400 0000 0002 88c4 0005 fe06 0400 0000 0002 7e34 0005 fe17 0400 0000
1646540 0002 8928 0005 fe32 6400 0000 0002 7cd0 0005 fe65 6400 0000 0002 7cd0 0005 fe6b 8400 0000 0002 7cd0 0005 fe73 8000 0000
1646620 0000 0000 0005 fe9d 8000 0000 0000 0000 0005 feb7 8000 0000 0000 0000 0005 fee2 8000 0000 0000 0000 0005 ff04 8000 0000
1646700 0000 0000 0005 ff27 8000 0000 0000 0000 0005 ff4d 8000 0000 0000 0000 0005 ff6f 8000 0000 0000 0000 0005 ff90 8000 0000
1646760 0000 0000 0005 ffa9 8000 0000 0000 0000 0005 ffc4 8000 0000 0000 0000 0005 ffd8 8000 0000 0000 0000 0005 ffea 8000 0004
1647040 ffff fb05 0006 0008 8000 0008 ffff fb05 0006 0045 8000 0001 ffff fb05 0006 0062 8000 0004 ffff fb05 0006 0070 2000 0004
1647120 0000 0000 0006 007d 2000 0004 0000 0000 0006 008d 2000 0001 0000 0000 0006 00ac 2000 0004 0000 0000 0006 00b7 2000 0004
1647200 0000 0000 0006 00c4 2000 0004 0000 0000 0006 00d1 2000 0001 0000 0000 0006 00e0 2000 0004 0000 0000 0006 00ee 2000 0004
1647260 0000 0000 0006 00fc 8000 0004 ffff fb05 0006 010d 8000 0004 ffff fb05 0006 011b 8000 0004 ffff fb05 0006 012c 8000 0004
1647340 ffff fb05 0006 013d 8000 0004 ffff fb05 0006 01b4 8000 0004 ffff fb05 0006 024c 8000 0004 ffff fb05 0006 0290 8000 0004
1647420 ffff fb05 0006 0310 8000 0004 ffff fb05 0006 038a 8000 0004 ffff fb05 0006 03b8 8000 003c ffff fb05 0006 04cf 8000 003c
1647500 ffff fb05 0006 05cb 2000 0004 0000 0000 0006 05e2 2000 0004 0000 0000 0006 05fb 2000 0004 0000 0000 0006 0613 2000 0004
1647560 0000 0000 0006 0628 2000 0004 0000 0000 0006 063e 2000 0001 0000 0000 0006 0657 8000 0000 0000 0000 0006 071d 8000 0000
1647640 0000 0000 0006 07e3 8000 0000 0000 0000 0006 08a3 8000 0000 0000 0000 0006 08f7 8000 0028 ffff fb05 0006 0a11 8000 0028
1647720 ffff fb05 0006 0a76 8000 0000 0000 0000 0006 0b41 8000 0000 0000 0000 0006 0c0c 8000 0000 0000 0000 0006 0cca 8000 0000
1650000 0000 0000 0006 0d8e 8000 0000 0000 0000 0006 0e53 8000 0000 0000 0000 0006 0eb2 8000 0048 ffff fb05 0006 0f30 8000 0000
1650060 0000 0000 0006 0ff4 8000 0000 0000 0000 0006 10be 8000 0000 0000 0000 0006 1193 8000 0000 0000 0000 0006 125f 8000 0000
1650140 0000 0000 0006 12fd 8000 0044 ffff fb05 0006 1354 8000 0000 0000 0000 0006 141a 8000 0000 0000 0000 0006 14e5 8000 0000
1650220 0000 0000 0006 15b2 8000 0000 0000 0000 0006 15f4 2400 0044 0002 7cd0 0006 1614 a000 0044 0000 0044 0006 1624 a000 0001
1650300 0000 0048 0006 1630 8400 0000 0002 7cd0 0000 0000 4400 01d1 0002 7cd0 0006 164d 4000 0044 0000 0019 0000 0000 4400 01d1
1650360 0002 7ce0 0006 165d 8000 0000 0000 0000 0006 166a 8000 0000 0000 0000 0000 0000 4400 01d2 0002 7ce0 0000 0000 4400 01d3
1650440 0002 7d14 0000 0000 4400 01d4 0002 7db8 0000 0000 4400 01d6 0002 7de8 0000 0000 4400 01d8 0002 7e18 0000 0000 4400 01d9
1650520 0002 7e24 0006 1674 8000 0000 0000 0000 0006 1689 8000 0050 ffff fb05 0006 1704 8000 0000 0000 0000 0006 178b 2000 0000
1650600 0000 0000 0006 17ad 2000 0000 0000 0000 0006 17d0 2000 0000 0000 0000 0006 17dd 2000 0000 0000 0000 0006 17ea 8000 0001
1650660 ffff fb05 0006 1824 2000 0004 0000 0000 0006 1946 2000 0004 0000 0000 0006 1868 8000 0000 0000 0000 0006 18f5 2800 0001
1650740 0004 aee8 0006 190b 8000 0004 ffff fb05 0006 1917 8000 0008 ffff fb05 0006 197a 8000 0000 0000 0000 0006 19f6 8000 0004
1651020 ffff fb05 0006 1a2b 8000 0000 0000 0000 0006 1a7f 8000 0008 ffff fb05 0006 1aea 8000 0000 0000 0000 0006 1b50 8000 0004
1651100 ffff fb05 0006 1b85 8000 0000 0000 0000 0006 1be1 8000 0008 ffff fb05 0006 1c44 8000 0000 0000 0000 0006 1caa 8000 0004
1651160 ffff fb05 0006 1cdf 8000 0000 0000 0000 0006 1d3b 8000 0008 ffff fb05 0006 1da9 8000 0000 0000 0000 0006 1e36 8000 0004
1651240 ffff fb05 0006 1e6d 8000 0000 0000 0000 0006 1ecf 8000 0008 ffff fb05 0006 1f25 8000 0000 0000 0000 0006 1fa6 8000 0004
1651320 ffff fb05 0006 1fdd 8000 0000 0000 0000 0006 2035 8000 0008 ffff fb05 0006 208b 8000 0000 0000 0000 0006 20f5 8000 0004
1651400 ffff fb05 0006 212c 8000 0000 0000 0000 0006 218c 8000 0008 ffff fb05 0006 21e2 8000 0000 0000 0000 0006 224c 8000 0004
1651460 ffff fb05 0006 2283 8000 0000 0000 0000 0006 22e3 8000 0008 ffff fb05 0006 233c 8000 0000 0000 0000 0006 23ce 8000 0004
1651540 ffff fb05 0006 2407 8000 0000 0000 0000 0006 246d 8000 0034 ffff fb05 0006 2586 8000 0034 ffff fb05 0006 2668 8000 0000
1651620 0000 0000 0006 2732 8000 0000 0000 0000 0006 275f 8000 0040 ffff fb05 0006 2877 8000 0040 ffff fb05 0006 2991 2000 0004
1651700 0000 0000 0006 29ab 8000 0000 0000 0000 0006 2a78 8000 0000 0000 0000 0006 2b23 8000 0084 ffff fb05 0006 2ba8 8000 0000
1651760 0000 0000 0006 2c7d 8000 0000 0000 0000 0006 2cf9 8000 0004 ffff fb05 0006 2d0d 8000 0004 ffff fb05 0006 2d49 8000 0004
1652040 ffff fb05 0006 2d9a 8000 0004 ffff fb05 0006 2dc8 8000 0004 ffff fb05 0006 2e03 8000 0004 ffff fb05 0006 2e41 8000 0004
1652120 ffff fb05 0006 2e63 8000 0004 ffff fb05 0006 2e85 2000 0001 0000 0000 0006 2e94 8000 0004 ffff fb05 0006 2ec3 8000 0000
1652200 0000 0000 0006 2f48 2000 0008 0000 0000 0006 2f69 8000 0008 ffff fb05 0006 2f74 8000 0008 ffff fb05 0006 2f80 8000 0008
```

```
1652260 ffff fb05 0006 2f8c 8000 0008 ffff fb05 0006 2fd8 8000 0000 0000 0000 0006 309e 8000 0000 0000 0000 0006 3103 8000 0044
1652340 ffff fb05 0006 3162 8000 0000 0000 0000 0006 3228 8000 0000 0000 0000 0006 3253 8000 0008 ffff fb05 0006 325f 8000 000c
1652420 ffff fb05 0006 32d2 8000 0000 0000 0000 0006 335e 8000 0008 ffff fb05 0006 33b2 8000 0000 0000 0000 0006 3432 8000 000c
1652500 ffff fb05 0006 34a8 8000 0000 0000 0000 0006 3553 2000 0008 0000 0000 0006 3576 8000 000c ffff fb05 0006 35da 8000 0000
1652560 0000 0000 0006 369b 8000 0000 0000 0000 0006 370b 2000 0008 0000 0000 0006 372a 8000 000c ffff fb05 0006 378f 8000 0000
1652640 0000 0000 0006 335d 8000 0000 0000 0000 0006 38cb 2000 0008 0000 0000 0006 38eb 8000 0008 ffff fb05 0006 394c 8000 0000
1652720 0000 0000 0006 39f3 8000 0010 ffff fb05 0006 3a83 8000 0000 0000 0000 0006 3b34 8000 0018 ffff fb05 0006 3bc4 8000 0000
1653000 0000 0000 0006 3c94 8000 0000 0000 0000 0006 3d1c 2000 0008 0000 0000 0006 3d3d 8000 0024 ffff fb05 0006 3e8a 8000 0000
1653060 0000 0000 0006 3f4a 8000 0000 0000 0000 0006 3fde 8000 0004 ffff fb05 0006 4027 8000 0000 0000 0000 0006 403a 8000 0010
1653140 ffff fb05 0006 40c3 8000 0000 0000 0000 0006 4187 8000 0000 0000 0000 0006 4246 8000 0000 0000 0000 0006 425d 2000 0008
1653220 0000 0000 0006 4280 8000 003c ffff fb05 0006 4388 8000 003c ffff fb05 0006 4413 8000 0000 0000 0000 0006 44d6 8000 0000
1653300 0000 0000 0006 45a8 8000 0000 0000 0000 0006 4573 8000 0000 0000 0000 0006 474f 8000 0000 0000 0000 0006 4829 8000 0000
1653360 0000 0000 0006 49f0 8000 0000 0000 0000 0006 493e 2000 0008 0000 0000 0006 4962 8000 001c ffff fb05 0006 4a06 8000 0000
1653440 0000 0000 0006 4ade 8000 0000 0000 0000 0006 4bb2 8000 0000 0000 0000 0006 4c88 8000 0000 0000 0000 0006 4cab 2000 0008
1653520 0000 0000 0006 4cd7 8000 003c ffff fb05 0006 4dd8 8000 003c ffff fb05 0006 4e3d 8000 0000 0000 0000 0006 4f03 8000 0000
1653600 0000 0000 0006 4fc0 8000 0000 0000 0000 0006 5053 2000 0008 0000 0000 0006 5074 8000 008c ffff fb05 0006 516f 8000 008c
1653660 ffff fb05 0006 5215 8000 0000 0000 0000 0006 52e2 8000 0000 0000 0000 0006 539f 8000 0000 0000 0000 0006 546e 8000 0000
1653740 0000 0000 0006 54f4 2000 0008 0000 0000 0006 5514 2400 003c 0002 7e34 0006 5535 a000 003c 0000 0044 0006 5546 8400 0000
1654020 0002 7e34 0000 0000 4400 0010 0002 7e34 0006 557a 4000 003c 0000 0018 0000 0000 4400 0010 0002 7e40 0006 558b 8000 0000
1654100 0000 0000 0000 0000 4400 000f 0002 7e40 0000 0000 4400 0010 0002 7f48 0000 0000 4400 0011 0002 7f4c 0000 0000 4400 0012
1654160 0002 7f50 0000 0000 4400 0010 0002 7f54 0000 0000 4400 0028 0002 7f68 0000 0000 4400 0029 0002 7f74 0006 5598 8000 0000
1654240 0000 0000 0006 55ad 8000 0034 ffff fb05 0006 56ff 8000 0000 0000 0000 0006 57c0 8000 0000 0000 0000 0006 5881 8000 0000
1654320 0000 0000 0006 5939 2000 0008 0000 0000 0006 595f 8000 0018 ffff fb05 0006 59f2 8000 0000 0000 0000 0006 5aba 8000 0000
1654400 0000 0000 0006 5af0 2000 0008 0000 0000 0006 5b13 8000 002c ffff fb05 0006 5bc8 8000 0000 0000 0000 0006 5c9b 8000 0000
1654460 0000 0000 0006 5127 2000 0008 0000 0000 0006 5d4b 8000 000c ffff fb05 0006 5dd9 8000 0000 0000 0000 0006 5ea8 8000 0000
1654540 0000 0000 0006 5ec6 8000 0040 ffff fb05 0006 5fc5 8000 0040 ffff fb05 0006 6068 8000 0000 0000 0000 0006 6120 2000 0008
1654620 0000 0000 0006 613e 2000 0001 0000 0000 0006 614d 2000 000c 0000 0000 0006 6162 2400 0001 0002 7f84 0006 617a a000 0040
1654700 0000 0044 0006 6194 8400 0000 0002 7f94 0000 0000 4400 0018 0002 7f84 0000 0000 4400 0018 0002 7f94 0006 619c 8000 0000
1654760 0000 0000 0000 0000 4400 0019 0002 7f94 0000 0000 4400 001a 0002 7fa0 0000 0000 4400 001b 0002 7fa8 0006 61a9 8000 0000
1655040 0000 0000 0006 61bf 2400 0001 0002 7fb8 0006 61e5 a000 0040 0000 0044 0006 61f6 a000 0008 0000 0048 0000 0000 4400 001f
1655120 0002 7fb8 0006 6203 4000 0040 0000 0018 0000 0000 4400 001f 0002 7fc8 0006 6214 8000 008c ffff fffc 0006 622a 8000 0004
1655200 ffff fff8 0006 623d 8000 000c ffff fff4 0006 6256 8000 000c ffff fff0 0006 6267 8000 000c ffff ffec 0006 6278 8000 000c
1655260 ffff ffe8 0006 6289 8000 000c ffff ffe4 0006 62a3 8000 0004 ffff ffe0 0006 62ba 8000 000c ffff ffdc 0000 0000 c000 0002
1655340 0000 02f8 0006 62cb 8000 0000 0000 0000 0000 0000 4400 005e 0002 7fc8 0006 62d8 6000 0000 0000 0000 0000 0000 4400 005f
1655420 0002 7fc8 0006 62e2 8000 0000 0000 0000 0000 0000 4400 0060 0002 7fc8 0006 62ec 8000 0000 0000 0000 0000 0000 4400 0061
1655500 0002 7fc8 0006 62fe 8000 0000 0000 0000 0000 0000 4400 0062 0002 7fc8 0006 630c 8000 0000 0000 0000 0000 0000 4400 0063
1655560 0002 7fc8 0006 631a 8000 0000 0000 0000 0000 0000 4400 0064 0002 7fc8 0006 6328 8000 0000 0000 0000 0000 0000 4400 0065
1655640 0002 7fc8 0006 633b 8000 0000 0000 0000 0000 0000 4400 0066 0002 7fc8 0006 634e 8000 0000 0000 0000 0000 0000 4400 0067
1655720 0002 7fc8 0000 0000 4400 0020 0002 7fc8 0000 0000 4400 0023 0002 7fd0 0000 0000 4400 0024 0002 7ff0 0000 0000 4400 0025
1656000 0002 803c 0000 0000 4400 0026 0002 8044 0000 0000 4400 0027 0002 8090 0000 0000 4400 0028 0002 8098 0000 0000 4400 0029
1656060 0002 80e4 0000 0000 4400 002a 0002 80ec 0000 0000 4400 002b 0002 8138 0000 0000 4400 002c 0002 8140 0000 0000 4400 002e
1656140 0002 8158 0000 0000 4400 0031 0002 815c 0000 0000 4400 0032 0002 818c 0000 0000 4400 0033 0002 81ac 0000 0000 4400 0037
1656220 0002 81bc 0000 0000 4400 0038 0002 81cc 0000 0000 4400 0039 0002 81ec 0000 0000 4400 003a 0002 820c 0000 0000 4400 003f
1656300 0002 821c 0000 0000 4400 0040 0002 8274 0000 0000 4400 0043 0002 827c 0000 0000 4400 0044 0002 8284 0000 0000 4400 0045
1656360 0002 82a0 0000 0000 4400 0047 0002 82bc 0000 0000 4400 0048 0002 82d8 0000 0000 4400 0049 0002 82f4 0000 0000 4400 004a
1656440 0002 8310 0000 0000 4400 004b 0002 832c 0000 0000 4400 004c 0002 8348 0000 0000 4400 004d 0002 8364 0000 0000 4400 004e
1656520 0002 8380 0000 0000 4400 004f 0002 839c 0000 0000 4400 0050 0002 83b8 0000 0000 4400 0051 0002 83d4 0000 0000 4400 0052
1656600 0002 83f0 0000 0000 4400 0053 0002 840c 0000 0000 4400 0054 0002 8428 0000 0000 4400 0055 0002 8444 0000 0000 4400 0056
1656660 0002 8460 0000 0000 4400 0058 0002 847c 0000 0000 4400 0059 0002 848c 0000 0000 4400 005b 0002 84b0 0000 0000 e000 0002
1656740 0000 07fc 0000 0000 4400 005c 0002 84cc 0006 635c 8000 0000 0000 0000 0006 6380 2400 0001 0002 84dc 0006 63ab a000 0040
1657020 0000 0044 0006 63bc a000 0001 0000 0048 0000 0000 4400 0061 0002 84dc 0006 63cc 4000 0040 0000 0018 0000 0000 4400 0061
1657100 0002 84ec 0006 63dd 8000 0000 0000 0000 0006 63ea 8000 0000 0000 0000 0000 0000 4400 0062 0002 84ec 0000 0000 4400 0066
1657160 0002 84f4 0000 0000 4400 0067 0002 85bc 0000 0000 4400 0068 0002 85c8 0006 63f7 8000 0000 0000 0000 0006 641f 2400 0001
1657240 0002 85d8 0006 643f 8400 0000 0002 85d8 0000 0000 4400 023b 0002 85d9 0000 0000 4400 023b 0002 85e4 0000 0000 4400 023c
1657320 0002 85f4 0006 645c 2400 0001 0002 8604 0000 0000 4400 023b 0002 8604 0000 0000 4400 023b 0002 8610 0000 0000 4400 023c
```

```
1657400  0002 8624 0006 647c 2000 0008 0000 c000 0006 64a5 2000 0008 0000 0000 0006 64e6 2000 0008 0000 0000 0006 651d 2400 0001
1657460  0002 8634 0006 653a a000 0040 0000 0044 0006 654b a000 0001 0000 0048 0006 6558 8400 0000 0002 8634 0000 0000 4400 000a
1657540  0002 8634 0000 0000 4400 000a 0002 8648 0006 6566 8000 0000 0000 0000 0006 6573 8000 0000 0000 0000 0000 0000 4400 000b
1657620  0002 8648 0000 0000 4400 0009 0002 8648 0000 0000 4400 000a 0002 865c 0000 0000 4400 0009 0002 8688 0006 657d 8000 0000
1657700  0000 0000 0006 6598 2400 0001 0002 8698 0006 65bd a000 0018 0000 0044 0006 65d7 a000 0001 0000 0048 0006 65e4 8400 0000
1657760  0002 8698 0006 6618 4000 0018 0000 0018 0000 0000 4400 0009 0002 86a8 0006 6629 8000 0000 0000 0000 0006 6636 8000 0000
1660040  0000 0000 0000 0000 4400 000a 0002 86a8 0000 0000 4400 0008 0002 86a8 0000 0000 4400 0009 0002 86b8 0000 0000 4400 000a
1660120  0002 86c8 0006 6640 8000 0000 0000 0000 0006 6663 2400 0001 0002 86d8 0006 6689 a000 001c 0000 0044 0006 66a2 a000 0001
1660200  0000 0048 0006 66af 8400 0000 0002 86d8 0000 0000 4400 001c 0002 86d8 0006 66e6 4000 001c 0000 0018 0000 0000 4400 001c
1660260  0002 86e8 0006 66f7 8000 0000 0000 0000 0006 6704 8000 0000 0000 0000 0000 0000 4400 001d 0002 86e8 0000 0000 4400 001c
1660340  0002 86e8 0000 0000 4400 001d 0002 872c 0006 670e 8000 0000 0000 0000 0006 6732 2400 0001 0002 873c 0006 6761 a000 003c
1660420  0000 0044 0006 6771 a000 0001 0000 0048 0006 677e 8400 0000 0002 873c 0000 0000 4400 002e 0002 873c 0006 67b5 4000 003c
1660500  0000 0018 0000 0000 4400 002e 0002 874c 0006 67c5 8000 0000 0000 0000 0006 67d2 8000 0000 0000 0000 0000 0000 4400 002f
1660560  0002 874c 0000 0000 4400 002d 0002 874c 0006 67dc 8000 0000 0000 0000 0006 6809 2400 0001 0002 8770 0006 6826 a000 000c
1660640  0000 0044 0006 683f a000 0001 0000 0048 0006 684c 8400 0000 0002 8770 0000 0000 4400 0012 0002 8770 0006 6880 4000 000c
1660720  0000 0018 0000 0000 4400 0012 0002 8780 0006 6891 8000 0000 0000 0000 0006 689e 8000 0000 0000 0000 0000 0000 4400 0013
1661000  0002 8780 0000 0000 4400 0011 0002 8790 0000 0000 4400 0012 0002 87a4 0000 0000 4400 0013 0002 87d8 0006 68a8 8000 0000
1661060  0000 0000 0006 68c3 2400 0004 0002 87e8 0006 68e3 a000 0008 0000 0044 0006 68f3 a000 0004 0000 0048 0006 690d 8400 0000
1661140  0002 87e8 0000 0000 4400 001b 0002 87e8 0000 0000 4400 001b 0002 87fc 0006 6940 8000 0000 0000 0000 0006 694d 8000 0000
1661220  0000 0000 0000 0000 4400 001c 0002 87fc 0000 0000 4400 001a 0002 87fc 0006 695b 8000 0000 0000 0000 0006 6979 2400 0004
1661300  0002 8918 0006 6999 a000 0008 0000 0044 0006 69a9 a000 0004 0000 0048 0000 0000 4400 001a 0002 892c 0006 69bb 8000 0000
1661360  0000 0000 0006 69c8 8000 0000 0000 0000 0000 0000 4400 001b 0002 882c 0000 0000 4400 0019 0002 882c 0006 69d6 8000 0000
1661440  0000 0000 0006 69f4 2400 0001 0002 8848 0006 6a11 a000 0008 0000 0044 0006 6a21 a000 0001 0000 0048 0006 6a32 a000 0008
1661520  0000 004c 0000 0000 4400 0019 0002 8864 0006 6a43 8000 0000 0000 0000 0006 6a50 8000 0000 0000 0000 0000 0000 4400 001a
1661600  0002 8864 0006 6a5e 8000 0000 0000 0000 0000 0000 4400 001b 0002 8864 0000 0000 4400 0018 0002 8864 0006 6a6c 8000 0000
1661660  0000 0000 0006 6a87 2400 0001 0002 8874 0006 6aa4 a000 0008 0000 0044 0006 6ab4 a000 0001 0000 0048 0006 6ac5 a000 0004
1661740  0000 004c 0000 0000 4400 0018 0002 888c 0006 6ad5 8000 0000 0000 0000 0006 6ae2 8000 0000 0000 0000 0000 0000 4400 0019
1662020  0002 888c 0006 6af0 8000 0000 0000 0000 0000 0000 4400 001a 0002 888c 0000 0000 4400 0017 0002 888c 0006 6afe 8000 0000
1662100  0000 0000 0006 6b19 2400 0001 0002 889c 0006 6b37 a000 0008 0000 0044 0006 6b47 a000 0001 0000 0048 0006 6b59 a000 0001
1662160  0000 004c 0000 0000 4400 0017 0002 88b4 0006 6b69 8000 0000 0000 0000 0006 6b76 8000 0000 0000 0000 0000 0000 4400 0018
1662240  0002 88b4 0006 6b84 8000 0000 0000 0000 0000 0000 4400 0019 0002 88b4 0000 0000 4400 0016 0002 88b4 0006 6b92 8000 0000
1662320  0000 0000 0006 6bae 2400 0001 0002 88c4 0006 6bcc a000 0008 0000 0044 0006 6bdc a000 0001 0000 0048 0006 6bed a000 0004
1662400  0000 004c 0000 0000 4400 0016 0002 88dc 0006 6bfd 8000 0000 0000 0000 0006 6c0a 8000 0000 0000 0000 0000 0000 4400 0017
1662460  0002 88dc 0006 6c18 8000 0000 0000 0000 0000 0000 4400 0018 0002 88dc 0000 0000 4400 0015 0002 88dc 0006 6c26 8000 0000
1662540  0000 0000 0006 6c41 2400 0001 0002 88f8 0006 6c5d a000 0008 0000 0044 0006 6c6d a000 0004 0000 0048 0000 0000 4400 0015
1662620  0002 890c 0006 6c7d 8000 0000 0000 0000 0006 6c8a 8000 0000 0000 0000 0000 0000 4400 0016 0002 890c 0000 0000 4400 0014
1662700  0002 890c 0006 6c98 8000 0000 0000 0000 0006 6cb1 2400 0004 0002 8928 0006 6cd2 a000 0004 0000 0044 0006 6ce3 a000 0004
1662760  0000 0048 0006 6cf5 8400 0000 0002 8928 0000 0000 4400 0015 0002 8928 0000 0000 4400 0015 0002 893c 0006 6d27 8000 0000
1663040  0000 0000 0006 6d34 8000 0000 0000 0000 0000 0000 4400 0016 0002 893c 0000 0000 4400 0014 0002 893c 0006 6d42 8000 0000
1663120  0000 0000 0006 6d61 0400 0000 0002 8958 0006 6d6b 0400 0000 0002 9ad8 0006 6d94 0400 0000 0002 9be4 0006 6dab 0400 0000
1663200  0002 9c10 0006 6dc2 0400 0000 0002 99d0 0006 6ddd 0400 0000 0002 9a74 0006 6dfd 0400 0000 0002 9c94 0006 6e12 0400 0000
1663260  0002 9a34 0006 6e31 0400 0000 0002 8958 0006 6e42 0400 0000 0002 9c38 0006 6e5a 0800 0000 0004 aef0 0006 6e69 0400 0000
1663340  0002 9b84 0006 6e83 0400 0000 0002 9bb4 0006 6e9d 0400 0000 0002 9b0c 0006 6eb4 0400 0000 0002 9c60 0006 6ecb 0400 0000
1663420  0002 8abc 0006 6edc 0400 0000 0002 9cc4 0006 6ef7 6400 0000 0002 8958 0006 6f2a 6400 0000 0002 8958 0006 6f34 8400 0000
1663500  0002 8958 0006 6f40 8000 0000 0000 0000 0006 6f6a 8000 0000 0000 0000 0006 6f84 8000 0000 0000 0000 0006 6faf 8000 0000
1663560  0000 0000 0006 6fd1 8000 0000 0000 0000 0006 6ff4 8000 0000 0000 0000 0006 701a 8000 0000 0000 0000 0006 703c 8000 0000
1663640  0000 0000 0006 705d 8000 0000 0000 0000 0006 7076 8000 0000 0000 0000 0006 7091 8000 0000 0000 0000 0006 70a5 8000 0000
1663720  0000 0000 0006 70b7 8000 0004 ffff fb05 0006 70d5 8000 0008 ffff fb05 0006 7112 8000 0001 ffff fb05 0006 712f 8000 0004
1664000  ffff fb05 0006 713d 2000 0004 0000 0000 0006 714a 2000 0004 0000 0000 0006 715a 2000 0001 0000 0000 0006 7179 2000 0004
1664060  0000 0000 0006 7184 2000 0004 0000 0000 0006 7191 2000 0004 0000 0000 0006 719e 2000 0001 0000 0000 0006 71ad 2000 0004
1664140  0000 0000 0006 71bb 2000 0004 0000 0000 0006 71c9 8000 0004 ffff fb05 0006 71da 8000 0004 ffff fb05 0006 71e8 8000 0004
1664220  ffff fb05 0006 71f9 8000 0004 ffff fb05 0006 720a 8000 0004 ffff fb05 0006 7281 8000 0004 ffff fb05 0006 7319 8000 0004
1664300  ffff fb05 0006 735d 8000 0004 ffff fb05 0006 73dd 8000 0004 ffff fb05 0006 7457 8000 0004 ffff fb05 0006 7485 8000 003c
1664360  ffff fb05 0006 759c 8000 003c ffff fb05 0006 7698 2000 0004 0000 0000 0006 76af 2000 0004 0000 0000 0006 76c8 2000 0004
1664440  0000 0000 0006 76e0 2000 0004 0000 0000 0006 76f5 2000 0004 0000 0000 0006 770b 2000 0001 0000 0000 0006 7724 8000 0000
```

```
1664520 000c 0000 0006 77ea 8000 0000 0000 0000 0006 78b0 8000 0000 0000 0000 0006 7970 8000 0000 0000 0000 0006 79c4 8000 0028
1664600 ffff fb05 0006 7ade 8000 0028 ffff fb05 0006 7b43 8000 0000 0000 0000 0006 7c0e 8000 0000 0000 0000 0006 7cd9 8000 0000
1664660 000c 0000 0006 7d97 8000 0000 0000 0000 0006 7e5b 8000 0000 0000 0000 0006 7f20 8000 0000 0000 0000 0006 7f7f 8000 0048
1664740 ffff fb05 0006 7ffd 8000 0000 0000 0000 0006 80c1 8000 0000 0000 0000 0006 818b 8000 0000 0000 0000 0006 8260 8000 0000
1665020 0000 0000 0006 832c 8000 0000 0000 0000 0006 83ca 8000 0044 ffff fb05 0006 8421 8000 0000 0000 0000 0006 84e7 8000 0000
1665100 0000 0000 0006 85b2 8000 0000 0000 0000 0006 867f 8000 0000 0000 0000 0006 86c1 2400 0044 0002 8958 0006 86e1 a000 0044
1665160 0000 0044 0006 86f1 a000 0001 0000 0048 0006 86fd 8400 0000 0002 8958 0000 0000 4400 01d1 0002 8958 0006 871a 4000 0044
1665240 0000 0018 0000 0000 4400 01d1 0002 8968 0006 872a 8000 0000 0000 0000 0006 8737 8000 0000 0000 0000 0000 0000 4400 01d2
1665320 0002 8968 0000 0000 4400 01d3 0002 899c 0000 0000 4400 01d4 0002 8a40 0000 0000 4400 01d6 0002 8a70 0000 0000 4400 01d8
1665400 0002 8aa0 0000 0000 4400 01d9 0002 8aac 0006 8741 8000 0000 0000 0000 0006 8756 8000 0050 ffff fb05 0006 87d1 8000 0000
1665460 0000 0000 0006 8858 2000 0000 0000 0000 0006 887a 2000 0000 0000 0000 0006 889d 2000 0000 0000 0000 0006 88aa 2000 0000
1665540 0000 0000 0006 88b7 8000 0001 ffff fb05 0006 88f1 2000 0004 0000 0000 0006 8913 2000 0004 0000 0000 0006 8935 8000 0000
1665620 0000 0000 0006 89c2 2800 0001 0004 aef0 0006 89d8 8000 0004 ffff fb05 0006 89e4 8000 0008 ffff fb05 0006 8a47 8000 0000
1665700 0000 0000 0006 8ac3 8000 0004 ffff fb05 0006 8af8 8000 0000 0000 0000 0006 8b4c 8000 0008 ffff fb05 0006 8bb7 8000 0000
1665760 0000 0000 0006 8c1d 8000 0004 ffff fb05 0006 8c52 8000 0000 0000 0000 0006 8cae 8000 0008 ffff fb05 0006 8d11 8000 0000
1666040 0000 0000 0006 8d77 8000 0004 ffff fb05 0006 8dac 8000 0000 0000 0000 0006 8e08 8000 0008 ffff fb05 0006 8e76 8000 0000
1666120 0000 0000 0006 8f03 8000 0004 ffff fb05 0006 8f3a 8000 0000 0000 0000 0006 8f9c 8000 0008 ffff fb05 0006 8ff2 8000 0000
1666200 0000 0000 0006 9073 8000 0004 ffff fb05 0006 90aa 8000 0000 0000 0000 0006 9102 8000 0008 ffff fb05 0006 9158 8000 0000
1666260 0000 0000 0006 91c2 8000 0004 ffff fb05 0006 91f9 8000 0000 0000 0000 0006 9259 8000 0008 ffff fb05 0006 92af 8000 0000
1666340 0000 0000 0006 9319 8000 0004 ffff fb05 0006 9350 8000 0000 0000 0000 0006 93b0 8000 0008 ffff fb05 0006 9409 8000 0000
1666420 0000 0000 0006 949b 8000 0004 ffff fb05 0006 94d4 8000 0000 0000 0000 0006 953a 8000 0034 ffff fb05 0006 9653 8000 0034
1666500 ffff fb05 0006 9735 8000 0000 0000 0000 0006 97ff 8000 0000 0000 0000 0006 982c 8000 0040 ffff fb05 0006 9944 8000 0040
1666560 ffff fb05 0006 9a5e 2000 0004 0000 0000 0006 9a78 8000 0000 0000 0000 0006 9b45 8000 0000 0000 0000 0006 9bf0 8000 0084
1666640 ffff fb05 0006 9c75 8000 0000 0000 0000 0006 9d4a 8000 0000 0000 0000 0006 9dc6 8000 0004 ffff fb05 0006 9dda 8000 0004
1666720 ffff fb05 0006 9e16 8000 0004 ffff fb05 0006 9e57 8000 0004 ffff fb05 0006 9e95 8000 0004 ffff fb05 0006 9ed0 8000 0004
1667000 ffff fb05 0006 9f0e 8000 0004 ffff fb05 0006 9f30 8000 0004 ffff fb05 0006 9f52 2000 0001 0000 0000 0006 9f61 8000 0004
1667060 ffff fb05 0006 9f90 8000 0000 0000 0000 0006 a015 2000 0008 0000 0000 0006 a03a 8000 0008 ffff fb05 0006 a045 8000 0008
1667140 ffff fb05 0006 a051 8000 0008 ffff fb05 0006 a05d 8000 0008 ffff fb05 0006 a0a9 8000 0000 0000 0000 0006 a16f 8000 0000
1667220 0000 0000 0006 a1d1 8000 0044 ffff fb05 0006 a233 8000 0000 0000 0000 0006 a2f9 8000 0000 0000 0000 0006 a324 8000 0008
1667300 ffff fb05 0006 a330 8000 000c ffff fb05 0006 a3a3 8000 0000 0000 0000 0006 a42f 8000 0008 ffff fb05 0006 a483 8000 0000
1667360 0000 0000 0006 a503 8000 000c ffff fb05 0006 a579 8000 0000 0000 0000 0006 a624 2000 0008 0000 0000 0006 a64b 8000 000c
1667440 ffff fb05 0006 a6af 8000 0000 0000 0000 0006 a770 8000 0000 0000 0000 0006 a7e0 2000 0008 0000 0000 0006 a803 8000 000c
1667520 ffff fb05 0006 a868 8000 0000 0000 0000 0006 a936 8000 0000 0000 0000 0006 a9a4 2000 0008 0000 0000 0006 a9c8 8000 0008
1667600 ffff fb05 0006 aa29 8000 0000 0000 0000 0006 aad0 8000 0010 ffff fb05 0006 ab60 8000 0000 0000 0000 0006 ac11 8000 0018
1667660 ffff fb05 0006 aca1 8000 0000 0000 0000 0006 ad71 8000 0000 0000 0000 0006 adf9 2000 0008 0000 0000 0006 ae1e 8000 0024
1667740 ffff fb05 0006 af6b 8000 0000 0000 0000 0006 b02b 8000 0000 0000 0000 0006 b0bf 8000 0004 ffff fb05 0006 b108 8000 0000
1670020 0000 0000 0006 b11b 8000 0010 ffff fb05 0006 b1a4 8000 0000 0000 0000 0006 b268 8000 0000 0000 0000 0006 b327 8000 0000
1670100 0000 0000 0006 b33e 2000 0008 0000 0000 0006 b365 8000 003c ffff fb05 0006 b46d 8000 003c ffff fb05 0006 b4f8 8000 0000
1670160 0000 0000 0006 b5bb 8000 0000 0000 0000 0006 b681 8000 0000 0000 0000 0006 b758 8000 0000 0000 0000 0006 b834 8000 0000
1670240 0000 0000 0006 b90e 8000 0000 0000 0000 0006 b9d5 8000 0000 0000 0000 0006 ba23 2000 0008 0000 0000 0006 ba4b 8000 001c
1670320 ffff fb05 0006 baef 8000 0000 0000 0000 0006 bbc7 8000 0000 0000 0000 0006 bc9b 8000 0000 0000 0000 0006 bd71 8000 0000
1670400 0000 0000 0006 bd94 2000 0008 0000 0000 0006 bdc4 8000 003c ffff fb05 0006 bec5 8000 003c ffff fb05 0006 bf2a 8000 0000
1670460 0000 0000 0006 bff0 8000 0000 0000 0000 0006 c0ad 8000 0000 0000 0000 0006 c140 2000 0008 0000 0000 0006 c165 8000 008c
1670540 ffff fb05 0006 c260 8000 008c ffff fb05 0006 c306 8000 0000 0000 0000 0006 c3d3 8000 0000 0000 0000 0006 c490 8000 0000
1670620 0000 0000 0006 c55f 8000 0000 0000 0000 0006 c5e5 2000 0008 0000 0000 0006 c609 2400 003c 0002 8abc 0006 c62a a000 003c
1670700 0000 0044 0006 c63b 6400 0000 0002 8abc 0000 0000 4400 0010 0002 8abc 0006 c66f 4000 003c 0000 0018 0000 0000 4400 0010
1670760 0002 8ac8 0006 c680 8000 0000 0000 0000 0000 0000 4400 000f 0002 8ac8 0000 0000 4400 0010 0002 8bd0 0000 0000 4400 0011
1671040 0002 8bd4 0000 0000 4400 0012 0002 8bd8 0000 0000 4400 0010 0002 8bdc 0000 0000 4400 0028 0002 8bf0 0000 0000 4400 0029
1671120 0002 8bfc 0006 c68d 8000 0000 0000 0000 0006 c6a2 8000 0034 ffff fb05 0006 c7f4 8000 0000 0000 0000 0006 c8b5 8000 0000
1671200 0000 0000 0006 c976 8000 0000 0000 0000 0006 ca2e 2000 0008 0000 0000 0006 ca58 8000 0018 ffff fb05 0006 caeb 8000 0000
1671260 0000 0000 0006 cbb3 8000 0000 0000 0000 0006 cbe9 2000 0008 0000 0000 0006 cc10 8000 002c ffff fb05 0006 ccc5 8000 0000
1671340 0000 0000 0006 cd98 8000 0000 0000 0000 0006 ce24 2000 0008 0000 0000 0006 ce4c 8000 000c ffff fb05 0006 ceda 8000 0000
1671420 0000 0000 0006 cfa9 8000 0000 0000 0000 0006 cfc7 8000 004c ffff fb05 0006 d0da 8000 004c ffff fb05 0006 d1d5 8000 0000
1671500 0000 0000 0006 d2b7 8000 0000 0000 0000 0006 d2bb 2000 0008 0000 0000 0006 d2e1 2000 0001 0000 0000 0006 d2f0 2000 000c
1671560 0000 0000 0006 d305 2400 0001 0002 8c0c 0006 d321 a000 004c 0000 0044 0006 d33b 8400 0000 0002 8c0c 0000 0000 4400 0017
```

```
1671640 0002 8c0c 0006 d347 4000 004c 0000 0018 0000 0000 4400 0017 0002 8c18 0006 d358 8000 0004 ffff fffc 0000 0000 c000 0002
1671720 0000 02c0 0006 d36f 8000 0000 0000 c000 0000 0000 4400 0018 0002 8c18 0000 c000 4400 0019 0002 8c20 0000 0000 4400 001a
1672000 0002 8c40 0000 0000 440c 001b 0002 8c5c 0000 0000 4400 001c 0002 8c70 0000 0000 4400 001d 0002 8c80 0000 0000 4400 001e
1672060 0002 8ca0 0000 0000 4400 001f 0002 8cb0 0000 0000 4400 0020 0002 8cd0 0000 0000 4400 0021 0002 8ce0 0000 0000 4400 0022
1672140 0002 8d00 0000 0000 4400 0023 0002 8d10 0000 0000 4400 0024 0002 8d30 0000 0000 4400 0025 0002 8d40 0000 0000 4400 0026
1672220 0002 8d60 0000 0000 4400 0027 0002 8d70 0000 0000 4400 0028 0002 8d90 0000 0000 4400 002a 0002 8da0 0000 0000 4400 002b
1672300 0002 8dc0 0000 0000 e000 0002 0000 0478 0000 0000 4400 002d 0002 8dd0 0006 d37c 8000 0000 0000 0000 0006 d396 2400 0001
1672360 0002 8de0 0006 d3c0 a000 004c 0000 0044 0006 d3d1 a000 0008 0000 0048 0000 0000 4400 0031 0002 8de0 0006 d3de 4000 004c
1672440 0000 0018 0000 0000 4400 0031 0002 8df0 0006 d3ef 8000 008c ffff fffc 0006 d405 8000 003c ffff fff8 0006 d411 8000 000c
1672520 ffff fff4 0006 d42a 8000 000c ffff fff0 0006 d43b 8000 000c ffff ffec 0006 d44c 8000 000c ffff ffe8 0006 d45d 8000 000c
1672600 ffff ffe4 0006 d46e 8000 000c ffff ffe0 0006 d47f 8000 000c ffff ffdc 0006 d490 8000 000c ffff ffd8 0006 d4a1 8000 0004
1672660 ffff ffd4 0000 0000 c000 0002 0000 0498 0006 d4b8 8000 0000 0000 0000 0000 0000 4400 0084 0002 8df0 0006 d4c5 8000 0000
1672740 0000 0000 0000 0000 4400 0085 0002 8df0 0006 d4cf 8000 0000 0000 0000 0000 0000 4400 0086 0002 8df0 0006 d4d9 8000 0000
1673020 0000 0000 0000 0000 4400 0087 0002 8df0 0006 d4e3 8000 0000 0000 0000 0000 0000 4400 0088 0002 8df0 0006 d4f1 8000 0000
1673100 0000 0000 0000 0000 4400 0089 0002 8df0 0006 d4ff 8000 0000 0000 0000 0000 0000 4400 008a 0002 8df0 0006 d50d 8000 0000
1673160 0000 0000 0000 0000 4400 008b 0002 8df0 0006 d51b 8000 0000 0000 0000 0000 0000 4400 008c 0002 8df0 0006 d529 8000 0000
1673240 0000 0000 0000 0000 4400 008d 0002 8df0 0006 d537 8000 0000 0000 0000 0000 0000 4400 008e 0002 8df0 0006 d545 8000 0000
1673320 0000 0000 0000 0000 4400 008f 0002 8df0 0000 0000 4400 0032 0002 8df0 0000 0000 4400 0035 0002 8df8 0000 0000 4400 0036
1673400 0002 8e18 0000 0000 4400 0037 0002 8e5c 0000 0000 4400 0038 0002 8e90 0000 0000 4400 003a 0002 8e98 0000 0000 4400 003b
1673460 0002 8edc 0000 0000 4400 003c 0002 8f10 0000 0000 4400 003e 0002 8f18 0000 0000 4400 003f 0002 8f5c 0000 0000 4400 0040
1673540 0002 8f90 0000 0000 4400 0042 0002 8f98 0000 0000 4400 0043 0002 8fdc 0000 0000 4400 0044 0002 9010 0000 0000 4400 0046
1673620 0002 9018 0000 0000 4400 0047 0002 905c 0000 0000 4400 0048 0002 9090 0000 0000 4400 004a 0002 9098 0000 0000 4400 004b
1673700 0002 90dc 0000 0000 4400 004c 0002 9110 0000 0000 4400 004e 0002 9118 0000 0000 4400 004f 0002 915c 0000 0000 4400 0050
1673760 0002 9190 0000 0000 4400 0052 0002 9198 0000 0000 4400 0053 0002 91e4 0000 0000 4400 0056 0002 91ec 0000 0000 4400 0057
1674040 0002 91fc 0000 0000 4400 0058 0002 921c 0000 0000 4400 005b 0002 923c 0000 0000 4400 005d 0002 9244 0000 0000 4400 005e
1674120 0002 9274 0000 0000 4400 005f 0002 9290 0000 0000 4400 0061 0002 92a0 0000 0000 4400 0063 0002 92a8 0000 0000 4400 0064
1674200 0002 92f8 0000 0000 4400 0065 0002 9314 0000 0000 4400 0067 0002 9324 0000 0000 4400 006c 0002 932c 0000 0000 4400 006d
1674260 0002 938c 0000 0000 4400 006e 0002 93a8 0000 0000 4400 0070 0002 93b8 0000 0000 4400 0073 0002 93c0 0000 0000 4400 0074
1674340 0002 93f0 0000 0000 4400 0075 0002 940c 0000 0000 4400 0077 0002 941c 0000 0000 4400 0078 0002 943c 0000 0000 4400 0079
1674420 0002 945c 0000 0000 4400 007b 0002 946c 0000 0000 4400 007e 0002 9474 0000 0000 4400 007f 0002 9494 0000 0000 4400 005b
1674500 0002 94ac 0000 0000 e000 0002 0000 0b9c 0000 0000 4400 0081 0002 94f4 0006 d553 8000 0000 0000 0000 0006 d57b 2400 0001
1674560 0002 9504 0006 d5aa a000 004c 0000 0044 0006 d5bb a000 0001 0000 0048 0000 0000 4400 0087 0002 9504 0006 d5cb 4000 004c
1674640 0000 0018 0000 0000 4400 0087 0002 9514 0006 d5dc 8000 0004 ffff fffc 0000 0000 c000 0002 0000 0bbc 0006 d5ec 8000 0000
1674720 0000 0000 0000 0000 4400 0089 0002 9514 0006 d5f9 8000 0000 0000 0000 0000 0000 4400 008a 0002 9514 0006 d606 8000 0000
1675000 0000 0000 0000 0000 4400 008b 0002 9514 0000 0000 4400 008a 0002 9514 0000 0000 4400 008c 0002 951c 0000 0000 4400 0090
1675060 0002 9524 0000 0000 4400 0091 0002 95b0 0000 0000 4400 0094 0002 95b8 0000 0000 4400 0095 0002 95e8 0000 0000 4400 0096
1675140 0002 9608 0000 0000 4400 0097 0002 9638 0000 0000 4400 0098 0002 9658 0000 0000 4400 009c 0002 9674 0000 0000 4400 009d
1675220 0002 96b8 0000 0000 4400 00a5 0002 96c0 0000 0000 4400 00a6 0002 9788 0000 0000 4400 00ac 0002 9790 0000 0000 4400 00ad
1675300 0002 9860 0000 0000 4400 00b3 0002 9868 0000 0000 4400 00b4 0002 98e0 0000 0000 4400 00b7 0002 98e8 0000 0000 4400 00b8
1675360 0002 9908 0000 0000 4400 008c 0002 9910 0000 0000 4400 00bb 0002 9958 0000 0000 e000 0002 0000 100c 0000 0000 4400 00bc
1675440 0002 9964 0006 d615 8000 0000 0000 0000 0006 d641 2400 0001 0002 9974 0006 d665 8400 0000 0002 9974 0000 0000 4400 023b
1675520 0002 9974 0000 0000 4400 023b 0002 9990 0000 0000 4400 023c 0002 9990 0006 d682 2400 0001 0002 99a0 0000 0000 4400 023b
1675600 0002 99a0 0000 0000 4400 023b 0002 99ac 0000 0000 4400 023c 0002 99c0 0006 d6a6 2000 0008 0000 0000 0006 d6d3 2000 0008
1675660 0000 0000 0006 d718 2000 0008 0000 0000 0006 d753 2400 0001 0002 99d0 0006 d774 a000 004c 0000 0044 0006 d785 a000 0001
1675740 0000 0048 0006 d792 8400 0000 0002 99d0 0000 0000 4400 0009 0002 99d0 0000 0000 4400 0009 0002 99e4 0006 d7a4 8000 0000
1676020 0000 0000 0006 d7b1 8000 0000 0000 0000 0000 0000 4400 000a 0002 99e4 0000 0000 4400 0008 0002 99e4 0000 0000 4400 0009
1676100 0002 99f8 0000 0000 4400 0008 0002 9a24 0006 d7bb 8000 0000 0000 0000 0006 d7da 2400 0001 0002 9a34 0006 d7ff a000 0018
1676160 0000 0044 0006 d819 a000 0001 0000 0048 0006 d826 8400 0000 0002 9a34 0000 0000 4400 0009 0002 9a34 0006 d85a 4000 0018
1676240 0000 0018 0000 0000 4400 0009 0002 9a44 0006 d86b 8000 0000 0000 0000 0006 d878 8000 0000 0000 0000 0000 0000 4400 000a
1676320 0002 9a44 0000 0000 4400 0008 0002 9a44 0000 0000 4400 0009 0002 9a54 0000 0000 4400 000a 0002 9a64 0006 d882 8000 0000
1676400 0000 0000 0006 d9a5 2400 0001 0002 9a74 0006 d8cb a000 001c 0000 0044 0006 d8e4 a000 0001 0000 0048 0006 d8f1 8400 0000
1676460 0002 9a74 0000 0000 4400 001c 0002 9a74 0006 d928 4000 001c 0000 0018 0000 0000 4400 001c 0002 9a84 0006 d939 8000 0000
1676540 0000 0000 0006 d946 8000 0000 0000 0000 0000 0000 4400 001d 0002 9a84 0000 0000 4400 001c 0002 9a84 0000 0000 4400 001d
1676620 0002 9ac8 0006 d950 8000 0000 0000 0000 0006 d974 2400 0001 0002 9ad8 0006 d9a3 a000 003c 0000 0044 0006 d9b3 a000 0001
1676700 0000 0048 0006 d9c0 8400 0000 0002 9ad8 0000 0000 4400 002e 0002 9ad8 0006 d9f7 4000 003c 0000 0018 0000 0000 4400 002e
```

```
1676760 0002 9ae8 0006 da07 8000 0000 0000 0000 0006 da14 8000 0000 0000 0000 0000 0000 4400 002f 0002 9ae8 0000 0000 4400 002d
1677040 0002 9ae8 0006 da1e 8000 0000 0000 0000 0006 da4b 240c 0001 0002 9b0c 0006 da68 a000 000c 0000 0044 0006 da81 a000 0001
1677120 0000 0048 0006 da8e 8400 0000 0002 9b0c 0000 0000 4400 0012 0002 9b0c 0006 dac2 4000 000c 0000 0018 0000 0000 4400 0012
1677200 0002 9b1c 0006 dad3 8000 0000 0000 0000 0006 dae0 8000 0000 0000 0000 0000 0000 4400 0013 0002 9b1c 0000 0000 4400 0011
1677260 0002 9b1c 0000 0000 4400 0012 0002 9b40 0000 0000 4400 0013 0002 9b74 0006 daea 8000 0000 0000 0000 0006 db05 2400 0004
1677340 0002 9b84 0006 db25 a000 0008 0000 0044 0006 db35 a000 0004 0000 0048 0006 db4f 8400 0000 0002 9b84 0000 0000 4400 001b
1677420 0002 9b84 0000 0000 4400 001b 0002 9b98 0006 db82 8000 0000 0000 0000 0006 db8f 8000 0000 0000 0000 0000 0000 4400 001c
1677500 0002 9b98 0000 0000 4400 001a 0002 9b98 0006 db9d 8000 0000 0000 0000 0006 dbbb 2400 0004 0002 9bb4 0006 dbdb a000 0008
1677560 0000 0044 0006 dbeb a000 0004 0000 0048 0000 0000 4400 001a 0002 9bc8 0006 dbfd 8000 0000 0000 0000 0006 dc0a 8000 0000
1677640 0000 0000 0000 0000 4400 001b 0002 9bc8 0000 0000 4400 0019 0002 9bc8 0006 dc18 8000 0000 0000 0000 0006 dc36 2400 0001
1677720 0002 9be4 0006 dc53 a000 0008 0000 0044 0006 dc63 a000 0001 0000 0048 0006 dc74 a000 0008 0000 004c 0000 0000 4400 0019
1700000 0002 9c00 0006 dc85 8000 0000 0000 0000 0006 dc92 8000 0000 0000 0000 0000 0000 4400 001a 0002 9c00 0006 dca0 8000 0000
1700060 0000 0000 0000 0000 4400 001b 0002 9c00 0000 0000 4400 0018 0002 9c00 0006 dcae 8000 0000 0000 0000 0006 dcc9 2400 0001
1700140 0002 9c10 0006 dce6 a000 0008 0000 0044 0006 dcf6 a000 0001 0000 0048 0006 dd07 a000 0004 0000 004c 0000 0000 4400 0018
1700220 0002 9c28 0006 dd17 8000 0000 0000 0000 0006 dd24 8000 0000 0000 0000 0000 0000 4400 0019 0002 9c28 0006 dd32 8000 0000
1700300 0000 0000 0000 0000 4400 001a 0002 9c28 0000 0000 4400 0017 0002 9c28 0006 dd40 8000 0000 0000 0000 0006 dd5b 2400 0001
1700360 0002 9c38 0006 dd79 a000 0008 0000 0044 0006 dd89 a000 0001 0000 0048 0006 dd9a a000 0001 0000 004c 0000 0000 4400 0017
1700440 0002 9c50 0006 ddab 8000 0000 0000 0000 0006 ddb8 8000 0000 0000 0000 0000 0000 4400 0018 0002 9c50 0006 ddc6 8000 0000
1700520 0000 0000 0000 0000 4400 0019 0002 9c50 0000 0000 4400 0016 0002 9c50 0006 ddd4 8000 0000 0000 0000 0006 ddf0 2400 0001
1700600 0002 9c60 0006 de0e a000 0008 0000 0044 0006 de1e a000 0001 0000 0048 0006 de2f a000 0004 0000 004c 0000 0000 4400 0016
1700660 0002 9c78 0006 de3f 8000 0000 0000 0000 0006 de4c 8000 0000 0000 0000 0000 0000 4400 0017 0002 9c78 0006 de5a 8000 0000
1700740 0000 0000 0000 0000 4400 0018 0002 9c78 0000 0000 4400 0015 0002 9c78 0006 de68 8000 0000 0000 0000 0006 de83 2400 0001
1701020 0002 9c94 0006 de9f a000 0008 0000 0044 0006 deaf a000 0004 0000 0048 0000 0000 4400 0015 0002 9ca8 0006 debf 8000 0000
1701100 0000 0000 0006 decc 8000 0000 0000 0000 0000 0000 4400 0016 0002 9ca8 0000 0000 4400 0014 0002 9ca8 0006 deda 8000 0000
1701160 0000 0000 0006 def3 2400 0004 0002 9cc4 0006 df14 a000 0004 0000 0044 0006 df25 a000 0004 0000 0048 0006 df37 8400 0000
1701240 0002 9cc4 0000 0000 4400 0015 0002 9cc4 0000 0000 4400 0015 0002 9cd8 0006 df69 8000 0000 0000 0000 0006 df76 8000 0000
1701320 0000 0000 0000 0000 4400 0016 0002 9cd8 0000 0000 4400 0014 0002 9cd8 0006 df84 8000 0000 0000 0000 0006 dfa3 0400 0000
1701400 0002 9cf8 0006 dfad 0400 0000 0002 a394 0006 dfd6 0400 0000 0002 a4a0 0006 dfed 0400 0000 0002 a4cc 0006 e004 0400 0000
1701460 0002 a28c 0006 e01f 0400 0000 0002 a330 0006 e03f 0400 0000 0002 a550 0006 e054 0400 0000 0002 a2f0 0006 e073 0400 0000
1701540 0002 9cf8 0006 e084 0400 0000 0002 a4f4 0006 e09c c800 0000 0004 aef8 0006 e0ab 0400 0000 0002 a440 0006 e0c5 0400 0000
1701620 0002 a470 0006 e0df 0400 0000 0002 a3c8 0006 e0f6 c400 0000 0002 a51c 0006 e10d 0400 0000 0002 9e5c 0006 e11e 0400 0000
1701700 0002 a580 0006 e139 6400 0000 0002 9cf8 0006 e16c 6400 0000 0002 9cf8 0006 e176 8400 0000 0002 9cf8 0006 e182 8000 0000
1701760 0000 0000 0006 e1ac 8000 0000 0000 0000 0006 e1c6 8000 0000 0000 0000 0006 e1f1 8000 0000 0000 0000 0006 e213 8000 0000
1702040 0000 0000 0006 e236 8000 0000 0000 0000 0006 e25c 8000 0000 0000 0000 0006 e27e 8000 0000 0000 0000 0006 e29f 8000 0000
1702120 0000 0000 0006 e2b8 8000 0000 0000 0000 0006 e2d3 8000 0000 0000 0000 0006 e2e7 8000 0000 0000 0000 0006 e2f9 8000 0004
1702200 ffff fb05 0006 e317 8000 0008 ffff fb05 0006 e354 8000 0001 ffff fb05 0006 e371 8000 0004 ffff fb05 0006 e37f 2000 0004
1702260 0000 0000 0006 e38c 2000 0004 0000 0000 0006 e39c 2000 0001 0000 0000 0006 e3bb 2000 0004 0000 0000 0006 e3c6 2000 0004
1702340 0000 0000 0006 e3d3 2000 0004 0000 0000 0006 e3e0 2000 0001 0000 0000 0006 e3ef 2000 0004 0000 0000 0006 e3fd 2000 0004
1702420 0000 0000 0006 e40b 8000 0004 ffff fb05 0006 e41c 8000 0004 ffff fb05 0006 e42a 8000 0004 ffff fb05 0006 e43b 8000 0004
1702500 ffff fb05 0006 e44c 8000 0004 ffff fb05 0006 e4c3 8000 0004 ffff fb05 0006 e55b 8000 0004 ffff fb05 0006 e59f 8000 0004
1702560 ffff fb05 0006 e61f 8000 0004 ffff fb05 0006 e699 8000 0004 ffff fb05 0006 e6c7 8000 003c ffff fb05 0006 e7de 8000 003c
1702640 ffff fb05 0006 e8da 2000 0004 0000 0000 0006 e8f1 2000 0004 0000 0000 0006 e90a 2000 0004 0000 0000 0006 e922 2000 0004
1702720 0000 0000 0006 e937 2000 0004 0000 0000 0006 e943 2000 0001 0000 0000 0006 e966 8000 0000 0000 0000 0006 ea2c 8000 0000
1703000 0000 0000 0006 eaf2 8000 0000 0000 0000 0006 ebb2 8000 0000 0000 0000 0006 ec06 8000 0028 ffff fb05 0006 ed20 8000 0028
1703060 ffff fb05 0006 e185 8000 0000 0000 0000 0006 ee50 8000 0000 0000 0000 0006 ef1b 8000 0000 0000 0000 0006 efd9 8000 0000
1703140 0000 0000 0006 f09d 8000 0000 0000 0000 0006 f162 8000 0000 0000 0000 0006 f1c1 8000 0048 ffff fb05 0006 f23f 8000 0000
1703220 0000 0000 0006 f303 8000 0000 0000 0000 0006 f3cd 8000 0000 0000 0000 0006 f4a2 8000 0000 0000 0000 0006 f56e 8000 0000
1703300 0000 0000 0006 f60c 8000 0044 ffff fb05 0006 f663 8000 0000 0000 0000 0006 f729 8000 0000 0000 0000 0006 f7f4 8000 0000
1703360 0000 0000 0006 f8c1 8000 0000 0000 0000 0006 f903 2400 0044 0002 9cf8 0006 f923 a000 0044 0000 0044 0006 f933 a000 0001
1703440 0000 0048 0006 f93f 8400 0000 0002 9cf8 0000 0000 4400 01d1 0002 9cf8 0006 f95c 4000 0044 0000 0018 0000 0000 4400 01d1
1703520 0002 9d08 0006 f96c 8000 0000 0000 0000 0006 f979 8000 0000 0000 0000 0000 0000 4430 01d2 0002 9d08 0000 0000 4400 01d3
1703600 0002 9d3c 0000 0000 4400 01d4 0002 9de0 0000 0000 4400 01d6 0002 9e10 0000 0000 4400 01d8 0002 9e40 0000 0000 4400 01d9
1703660 0002 9e4c 0006 f983 8000 0000 0000 0000 0006 f998 8000 0050 ffff fb05 0006 fa13 8000 0000 0000 0000 0006 fa9a 2000 0000
1703740 0000 0000 0006 fabc 2000 0000 0000 0000 0006 fadf 2000 0000 0000 0000 0006 faec 2000 0000 0000 0000 0006 faf9 8000 0001
1704020 ffff fb05 0006 fb33 2000 0004 0000 0000 0006 fb55 2000 0004 0000 0000 0006 fb77 8000 0000 0000 0000 0006 fc04 2800 0001
```

```
1704100 0004 aef8 0006 fc1a 8000 0004 ffff fb05 0006 fc26 8000 0008 ffff fb05 0006 fc89 8000 0000 0000 0000 0006 fd05 8000 0004
1704160 ffff fb05 0006 fd3a 8000 0000 0000 0000 0006 fd8e 8000 0008 ffff fb05 0006 fdf9 8000 0000 0000 0000 0006 fe5f 8000 0004
1704240 ffff fb05 0006 fe94 8000 0000 0000 0000 0006 fef0 8000 0008 ffff fb05 0006 ff53 8000 0000 0000 0000 0006 ffb9 8000 0004
1704320 ffff fb05 0006 ffee 8000 0000 0000 0000 0007 004a 8000 0008 ffff fb05 0007 00b8 8000 0000 0000 0000 0007 0145 8000 0004
1704400 ffff fb05 0007 017c 8000 0000 0000 0000 0007 01de 8000 0008 ffff fb05 0007 0234 8000 0000 0000 0000 0007 02b5 8000 0004
1704460 ffff fb05 0007 02ec 8000 0000 0000 0000 0007 0344 8000 0008 ffff fb05 0007 039a 8000 0000 0000 0000 0007 0404 8000 0004
1704540 ffff fb05 0007 043b 8000 0000 0000 0000 0007 049b 8000 0008 ffff fb05 0007 04f1 8000 0000 0000 0000 0007 055b 8000 0004
1704620 ffff fb05 0007 0592 8000 0000 0000 0000 0007 05f2 8000 0008 ffff fb05 0007 064b 8000 0000 0000 0000 0007 06dd 8000 0004
1704700 ffff fb05 0007 0716 8000 0000 0000 0000 0007 077c 8000 0034 ffff fb05 0007 0895 8000 0034 ffff fb05 0007 0977 8000 0000
1704760 0000 0000 0007 0a41 8000 0000 0000 0000 0007 0a6e 8000 0040 ffff fb05 0007 0b86 8000 0040 ffff fb05 0007 0ca0 2000 0004
1705040 0000 0000 0007 0cba 8000 0000 0000 0000 0007 0d97 8000 0000 0000 0000 0007 0e32 8000 0084 ffff fb05 0007 0eb7 8000 0000
1705120 0000 0000 0007 0f8c 8000 0000 0000 0000 0007 1008 8000 0004 ffff fb05 0007 101c 8000 0004 ffff fb05 0007 1058 8000 0004
1705200 ffff fb05 0007 1099 8000 0004 ffff fb05 0007 10d7 8000 0004 ffff fb05 0007 1112 8000 0004 ffff fb05 0007 1150 8000 0004
1705260 ffff fb05 0007 1172 8000 0004 ffff fb05 0007 1194 2000 0001 0000 0000 0007 11a3 8000 0004 ffff fb05 0007 11d2 8000 0000
1705340 0000 0000 0007 1257 2000 0008 0000 0000 0007 127c 8000 0008 ffff fb05 0007 1287 8000 0008 ffff fb05 0007 1293 8000 0008
1705420 ffff fb05 0007 129f 8000 0008 ffff fb05 0007 12eb 8000 0000 0000 0000 0007 13b1 8000 0000 0000 0000 0007 1413 8000 0044
1705500 ffff fb05 0007 1475 8000 0000 0000 0000 0007 153b 8000 0000 0000 0000 0007 1566 8000 0008 ffff fb05 0007 1572 8000 000c
1705560 ffff fb05 0007 15e5 8000 0000 0000 0000 0007 1671 8000 0008 ffff fb05 0007 16c5 8000 0000 0000 0000 0007 1745 8000 000c
1705640 ffff fb05 0007 17bb 8000 0000 0000 0000 0007 1866 2000 0008 0000 0000 0007 188d 8000 000c ffff fb05 0007 18f1 8000 0000
1705720 0000 0000 0007 19b2 8000 0000 0000 0000 0007 1a22 2000 0008 0000 0000 0007 1a45 8000 000c ffff fb05 0007 1aaa 8000 0000
1706000 0000 0000 0007 1b78 8000 0000 0000 0000 0007 1be6 2000 0008 0000 0000 0007 1c0a 8000 0008 ffff fb05 0007 1c6b 8000 0000
1706060 0000 0000 0007 1d12 8000 0010 ffff fb05 0007 1da2 8000 0000 0000 0000 0007 1e53 8000 0018 ffff fb05 0007 1ee3 8000 0000
1706140 0000 0000 0007 1fb3 8000 0000 0000 0000 0007 203b 2000 0008 0000 0000 0007 2060 8000 0024 ffff fb05 0007 21ad 8000 0000
1706220 0000 0000 0007 226d 8000 0000 0000 0000 0007 2301 8000 0004 ffff fb05 0007 234a 8000 0000 0000 0000 0007 235d 8000 0010
1706300 ffff fb05 0007 23e6 8000 0000 0000 0000 0007 24aa 8000 0000 0000 0000 0007 2569 8000 0000 0000 0000 0007 2580 2000 0008
1706360 0000 0000 0007 25a7 8000 003c ffff fb05 0007 26af 8000 003c ffff fb05 0007 273a 8000 0000 0000 0000 0007 27fd 8000 0000
1706440 0000 0000 0007 29cf 8000 0000 0000 0000 0007 299a 8000 0000 0000 0000 0007 2a76 8000 0000 0000 0000 0007 2b50 8000 0000
1706520 0000 0000 0007 2c17 8000 0000 0000 0000 0007 2c65 2000 0008 0000 0000 0007 2c8d 8000 001c ffff fb05 0007 2d31 8000 0000
1706600 0000 0000 0007 2e09 8000 0000 0000 0000 0007 2edd 8000 0000 0000 0000 0007 2fb3 8000 0000 0000 0000 0007 2fd6 2000 0008
1706660 0000 0000 0007 3006 8000 003c ffff fb05 0007 3107 8000 003c ffff fb05 0007 316c 8000 0000 0000 0000 0007 3232 8000 0000
1706740 0000 0000 0007 32ef 8000 0000 0000 0000 0007 3382 2000 0008 0000 0000 0007 33a7 8000 008c ffff fb05 0007 34a2 8000 008c
1707020 ffff fb05 0007 3548 8000 0000 0000 0000 0007 3615 8000 0000 0000 0000 0007 36d2 8000 0000 0000 0000 0007 37a1 8000 0000
1707100 0000 0000 0007 3927 2000 0008 0000 0000 0007 394b 2400 003c 0002 9e5c 0007 386c a000 003c 0000 0044 0007 387d 8400 0000
1707160 0002 9e5c 0000 0000 4400 0010 0002 9e5c 0007 38b1 4000 003c 0000 0018 0000 0000 4400 0010 0002 9e68 0007 39c2 8000 0000
1707240 0000 0000 0000 0000 4400 000f 0002 9e68 0000 0000 4400 0010 0002 9f70 0000 0000 4400 0011 0002 9f74 0000 0000 4400 0012
1707320 0002 9f78 0000 0000 4400 0010 0002 9f7c 0000 0000 4400 0028 0002 9f90 0000 0000 4400 0029 0002 9f9c 0007 38cf 8000 0000
1707400 0000 0000 0007 38e4 8000 0034 ffff fb05 0007 3a36 8000 0000 0000 0000 0007 3af7 8000 0000 0000 0000 0007 3bb8 8000 0000
1707460 0000 0000 0007 3c70 2000 0008 0000 0000 0007 3c9a 8000 0018 ffff fb05 0007 3d2d 8000 0000 0000 0000 0007 3df5 8000 0000
1707540 0000 0000 0007 3e2b 2000 0008 0000 0000 0007 3e52 8000 002c ffff fb05 0007 3f07 8000 0000 0000 0000 0007 3fda 8000 0000
1707620 0000 0000 0007 4066 2000 0008 0000 0000 0007 408e 8000 000c ffff fb05 0007 411c 8000 0000 0000 0000 0007 41eb 8000 0000
1707700 0000 0000 0007 4209 8000 0038 ffff fb05 0007 431c 8000 0038 ffff fb05 0007 439d 8000 0000 0000 0000 0007 447f 8000 0000
1707760 0000 0000 0007 4483 2000 0008 0000 0000 0007 44a9 2000 0001 0000 0000 0007 44b8 2000 000c 0000 0000 0007 44cd 2400 0001
1710040 0002 9fac 0007 44e9 a000 0038 0000 0044 0007 4503 8400 0000 0002 9fac 0000 0000 4400 0019 0002 9fac 0000 0000 4400 0019
1710120 0002 9fbc 0007 450f 8000 0000 0000 0000 0000 0000 4400 001a 0002 9fbc 0000 0000 4400 001b 0002 9fc8 0000 0000 4400 001c
1710200 0002 9fd0 0007 451c 8000 0000 0000 0000 0007 4536 2400 0001 0002 9fe0 0007 4560 a000 0038 0000 0044 0007 4571 a000 0008
1710260 0000 0048 0000 0000 4400 0022 0002 9fe0 0007 457e 4000 0038 0000 0018 0000 0000 4400 0022 0002 9ff0 0007 458f 8000 008c
1710340 ffff fffc 0007 45a5 8000 000c ffff fff8 0007 45be 8000 000c ffff fff4 0007 45cf 8000 000c ffff fff0 0007 45e0 8000 0004
1710420 ffff ffec 0000 0000 c000 0002 0000 02f8 0007 45f7 8000 0000 0000 0000 0000 0000 4400 0037 0002 9ff0 0007 4604 8000 0000
1710500 0000 0000 0000 0000 4400 0038 0002 9ff0 0007 460e 8000 0000 0000 0000 0000 0000 4400 0039 0002 9ff0 0007 4618 8000 0000
1710560 0000 0000 0000 0000 4400 003a 0002 9ff0 0007 4626 8000 0000 0000 0000 0000 0000 4400 003b 0002 9ff0 0007 4634 8000 0000
1710640 0000 0000 0000 0000 4400 003c 0002 9ff0 0000 0000 4400 0023 0002 9ff0 0000 0000 4400 0025 0002 9ff8 0000 0000 4400 0026
1710720 0002 a018 0000 0000 4400 0027 0002 a064 0000 0000 4400 0028 0002 a06c 0000 0000 4400 0029 0002 a0b8 0000 0000 4400 002a
1711000 0002 a0c0 0000 0000 4400 002b 0002 a10c 0000 0000 4400 002e 0002 a114 0000 0000 4400 002f 0002 a124 0000 0000 4400 0030
1711060 0002 a144 0000 0000 4400 0031 0002 a164 0000 0000 4400 0034 0002 a174 0000 0000 e000 0002 0000 0484 0000 0000 4400 0035
1711140 0002 a17c 0007 4642 8000 0000 0000 0000 0007 466a 2400 0001 0002 a18c 0007 4699 a000 0038 0000 0044 0007 46aa a000 0001
```

| | | | | | | | | | | | | | | | | | | | | | | | | |
|---|---|---|---|---|---|---|---|---|---|---|---|---|---|---|---|---|---|---|---|---|---|---|---|---|
| 1711220 | 0000 | 0048 | 0000 | 0000 | 4400 | 003a | 0002 | a18c | 0007 | 46ba | 4000 | 0038 | 0000 | 0019 | 0000 | 0000 | 4400 | 003a | 0002 | a19c | 0007 | 46cb | 8000 | 0000 |
| 1711300 | 0000 | 0000 | 0007 | 46d8 | 8000 | 0000 | 0000 | 0000 | 0000 | 0000 | 4400 | 003b | 0002 | a19c | 0000 | 0000 | 4400 | 003f | 0002 | a1a4 | 0000 | 0000 | 4400 | 0040 |
| 1711360 | 0002 | a214 | 0000 | 0000 | 4400 | 0041 | 0002 | a220 | 0007 | 46e5 | 8000 | 0000 | 0000 | 0000 | 0007 | 4711 | 2400 | 0001 | 0002 | a230 | 0007 | 4735 | 8400 | 0000 |
| 1711440 | 0002 | a230 | 0000 | 0000 | 4400 | 023b | 0002 | a230 | 0000 | 0000 | 4400 | 023b | 0002 | a23c | 0000 | 0000 | 4400 | 023c | 0002 | a24c | 0007 | 4752 | 2400 | 0001 |
| 1711520 | 0002 | a25c | 0000 | 0000 | 4400 | 023b | 0002 | a25c | 0000 | 0000 | 4400 | 023b | 0002 | a268 | 0000 | 0000 | 4400 | 023c | 0002 | a27c | 0007 | 4776 | 2000 | 0008 |
| 1711600 | 0000 | 0000 | 0007 | 47a3 | 2000 | 0008 | 0000 | 0000 | 0007 | 47e8 | 2000 | 0008 | 0000 | 0000 | 0007 | 4823 | 2400 | 0001 | 0002 | a28c | 0007 | 4844 | a000 | 0038 |
| 1711660 | 0000 | 0044 | 0007 | 4855 | a000 | 0001 | 0000 | 0048 | 0007 | 4862 | 8400 | 0000 | 0002 | a28c | 0000 | 0000 | 4400 | 000a | 0002 | a28c | 0000 | 0000 | 4400 | 000a |
| 1711740 | 0002 | a2a0 | 0007 | 4874 | 8000 | 0000 | 0000 | 0000 | 0007 | 4881 | 8000 | 0000 | 0000 | 0000 | 0000 | 0000 | 4400 | 000b | 0002 | a2a0 | 0000 | 0000 | 4400 | 0009 |
| 1712020 | 0002 | a2a0 | 0000 | 0000 | 4400 | 000a | 0002 | a2b4 | 0000 | 0000 | 4400 | 0009 | 0002 | a2e0 | 0007 | 488b | 8000 | 0000 | 0000 | 0000 | 0007 | 48aa | 2400 | 0001 |
| 1712100 | 0002 | a2f0 | 0007 | 48cf | a000 | 0018 | 0000 | 0044 | 0007 | 48e9 | a000 | 0001 | 0000 | 0048 | 0007 | 48f6 | 8400 | 0000 | 0002 | a2f0 | 0007 | 492a | 4000 | 0018 |
| 1712160 | 0000 | 0018 | 0000 | 0000 | 4400 | 0009 | 0002 | a300 | 0007 | 493b | 8000 | 0000 | 0000 | 0000 | 0007 | 4948 | 8000 | 0000 | 0000 | 0000 | 0000 | 0000 | 4400 | 000a |
| 1712240 | 0002 | a300 | 0000 | 0000 | 4400 | 0008 | 0002 | a30c | 0000 | 0000 | 4400 | 0009 | 0002 | a310 | 0000 | 0000 | 4400 | 000a | 0002 | a320 | 0007 | 4952 | 8000 | 0000 |
| 1712320 | 0000 | 0000 | 0007 | 4975 | 2400 | 0001 | 0002 | a330 | 0007 | 499b | a000 | 001c | 0000 | 0044 | 0007 | 49b4 | a000 | 0001 | 0000 | 0048 | 0007 | 49c1 | 8400 | 0000 |
| 1712400 | 0002 | a330 | 0000 | 0000 | 4400 | 001c | 0002 | a330 | 0007 | 49f8 | 4000 | 001c | 0000 | 0018 | 0000 | 0000 | 4400 | 001c | 0002 | a340 | 0007 | 4a09 | 8000 | 0000 |
| 1712460 | 0000 | 0000 | 0007 | 4a16 | 8000 | 0000 | 0000 | 0000 | 0000 | 0000 | 4400 | 001d | 0002 | a340 | 0000 | 0000 | 4400 | 001c | 0002 | a340 | 0000 | 0000 | 4400 | 001d |
| 1712540 | 0002 | a384 | 0007 | 4a20 | 8000 | 0000 | 0000 | 0000 | 0007 | 4a44 | 2400 | 0001 | 0002 | a394 | 0007 | 4a73 | a000 | 003c | 0000 | 0044 | 0007 | 4a93 | a000 | 0001 |
| 1712620 | 0000 | 0048 | 0007 | 4a9c | 8400 | 0000 | 0002 | a394 | 0000 | 0000 | 4400 | 002e | 0002 | a394 | 0007 | 4ac7 | 4000 | 003c | 0000 | 0018 | 0000 | 0000 | 4400 | 002e |
| 1712700 | 0002 | a3a4 | 0007 | 4ad7 | 8000 | 0000 | 0000 | 0000 | 0007 | 4ae4 | 8000 | 0000 | 0000 | 0000 | 0000 | 0000 | 4400 | 002f | 0002 | a3a4 | 0000 | 0000 | 4400 | 002d |
| 1712760 | 0002 | a3a4 | 0007 | 4aee | 8000 | 0000 | 0000 | 0000 | 0007 | 4b1b | 2400 | 0001 | 0002 | a3c8 | 0007 | 4b38 | a000 | 000c | 0000 | 0044 | 0007 | 4b51 | a000 | 0001 |
| 1713040 | 0000 | 0048 | 0007 | 4b5e | 8400 | 0000 | 0002 | a3c8 | 0000 | 0000 | 4400 | 0012 | 0002 | a3c8 | 0007 | 4b92 | 4000 | 000c | 0000 | 0018 | 0000 | 0000 | 4400 | 0012 |
| 1713120 | 0002 | a3d8 | 0007 | 4ba3 | 8000 | 0000 | 0000 | 0000 | 0007 | 4bb0 | 8000 | 0000 | 0000 | 0000 | 0000 | 0000 | 4400 | 0013 | 0002 | a3d8 | 0000 | 0000 | 4400 | 0011 |
| 1713200 | 0002 | a3d8 | 0000 | 0000 | 4400 | 0012 | 0002 | a3fc | 0000 | 0000 | 4400 | 0013 | 0002 | a430 | 0007 | 4bba | 8000 | 0000 | 0000 | 0000 | 0007 | 4bd5 | 2400 | 0004 |
| 1713260 | 0002 | a440 | 0007 | 4bf5 | a000 | 0008 | 0000 | 0044 | 0007 | 4c05 | a000 | 0004 | 0000 | 0048 | 0007 | 4c1f | 8400 | 0000 | 0002 | a440 | 0000 | 0000 | 4400 | 001b |
| 1713340 | 0002 | a440 | 0000 | 0000 | 4400 | 001b | 0002 | a454 | 0007 | 4c52 | 8000 | 0000 | 0000 | 0000 | 0007 | 4c5f | 8000 | 0000 | 0000 | 0000 | 0000 | 0000 | 4400 | 001c |
| 1713420 | 0002 | a454 | 0000 | 0000 | 4400 | 001a | 0002 | a454 | 0007 | 4c6d | 8000 | 0000 | 0000 | 0000 | 0007 | 4c8b | 2400 | 0004 | 0002 | a470 | 0007 | 4cab | a000 | 0008 |
| 1713500 | 0000 | 0044 | 0007 | 4cbb | a000 | 0004 | 0000 | 0048 | 0000 | 0000 | 4400 | 001a | 0002 | a484 | 0007 | 4ccd | 8000 | 0000 | 0000 | 0000 | 0007 | 4cda | 8000 | 0000 |
| 1713560 | 0000 | 0000 | 0000 | 0000 | 4400 | 001b | 0002 | a484 | 0000 | 0000 | 4400 | 0019 | 0002 | a484 | 0007 | 4ce8 | 8000 | 0000 | 0000 | 0000 | 0007 | 4d06 | 2400 | 0001 |
| 1713640 | 0002 | a4a0 | 0007 | 4d23 | a000 | 0008 | 0000 | 0044 | 0007 | 4d33 | a000 | 0001 | 0000 | 0048 | 0007 | 4d44 | a000 | 0008 | 0000 | 004c | 0000 | 0000 | 4400 | 0019 |
| 1713720 | 0002 | a4bc | 0007 | 4d55 | 8000 | 0000 | 0000 | 0000 | 0007 | 4d62 | 8000 | 0000 | 0000 | 0000 | 0000 | 0000 | 4400 | 001a | 0002 | a4bc | 0007 | 4d70 | 8000 | 0000 |
| 1714000 | 0000 | 0000 | 0000 | 0000 | 4400 | 001b | 0002 | a4bc | 0000 | 0000 | 4400 | 0018 | 0002 | a4bc | 0007 | 4d7e | 8000 | 0000 | 0000 | 0000 | 0007 | 4d99 | 2400 | 0001 |
| 1714060 | 0002 | a4cc | 0007 | 4db6 | a000 | 0008 | 0000 | 0044 | 0007 | 4dc6 | a000 | 0001 | 0000 | 0048 | 0007 | 4dd7 | a000 | 0004 | 0000 | 004c | 0000 | 0000 | 4400 | 0018 |
| 1714140 | 0002 | a4e4 | 0007 | 4de7 | 8000 | 0000 | 0000 | 0000 | 0007 | 4df4 | 8000 | 0000 | 0000 | 0000 | 0000 | 0000 | 4400 | 0019 | 0002 | a4e4 | 0007 | 4e02 | 8000 | 0000 |
| 1714220 | 0000 | 0000 | 0000 | 0000 | 4400 | 001a | 0002 | a4e4 | 0000 | 0000 | 4400 | 0017 | 0002 | a4e4 | 0007 | 4e10 | 8000 | 0000 | 0000 | 0000 | 0007 | 4e2b | 2400 | 0001 |
| 1714300 | 0002 | a4f4 | 0007 | 4e49 | a000 | 0008 | 0000 | 0044 | 0007 | 4e59 | a000 | 0001 | 0000 | 0048 | 0007 | 4e6a | a000 | 0001 | 0000 | 004c | 0000 | 0000 | 4400 | 0017 |
| 1714360 | 0002 | a50c | 0007 | 4e7b | 8000 | 0000 | 0000 | 0000 | 0007 | 4e88 | 8000 | 0000 | 0000 | 0000 | 0000 | 0000 | 4400 | 0018 | 0002 | a50c | 0007 | 4e96 | 8000 | 0000 |
| 1714440 | 0000 | 0000 | 0000 | 0000 | 4400 | 0019 | 0002 | a50c | 0000 | 0000 | 4400 | 0016 | 0002 | a50c | 0007 | 4ea4 | 8000 | 0000 | 0000 | 0000 | 0007 | 4ec0 | 2400 | 0001 |
| 1714520 | 0002 | a51c | 0007 | 4ede | a000 | 0008 | 0000 | 0044 | 0007 | 4eee | a000 | 0001 | 0000 | 0048 | 0007 | 4eff | a000 | 0004 | 0000 | 004c | 0000 | 0000 | 4400 | 0016 |
| 1714600 | 0002 | a534 | 0007 | 4f0f | 8000 | 0000 | 0000 | 0000 | 0007 | 4f1c | 8000 | 0000 | 0000 | 0000 | 0000 | 0000 | 4400 | 0017 | 0002 | a534 | 0007 | 4f2a | 8000 | 0000 |
| 1714660 | 0000 | 0000 | 0000 | 0000 | 4400 | 0018 | 0002 | a534 | 0000 | 0000 | 4400 | 0015 | 0002 | a534 | 0007 | 4f38 | 8000 | 0000 | 0000 | 0000 | 0007 | 4f53 | 2400 | 0001 |
| 1714740 | 0002 | a550 | 0007 | 4f6f | a000 | 0008 | 0000 | 0044 | 0007 | 4f7f | a000 | 0004 | 0000 | 0048 | 0000 | 0000 | 4400 | 0015 | 0002 | a564 | 0007 | 4f8f | 8000 | 0000 |
| 1715020 | 0000 | 0000 | 0007 | 4f9c | 8000 | 0000 | 0000 | 0000 | 0000 | 0000 | 4400 | 0016 | 0002 | a564 | 0000 | 0000 | 4400 | 0014 | 0002 | a564 | 0007 | 4faa | 8000 | 0000 |
| 1715100 | 0000 | 0000 | 0007 | 4fc3 | 2400 | 0004 | 0002 | a580 | 0007 | 4fe4 | a000 | 0004 | 0000 | 0044 | 0007 | 4ff5 | a000 | 0004 | 0000 | 0048 | 0007 | 5007 | 8400 | 0000 |
| 1715160 | 0002 | a580 | 0000 | 0000 | 4400 | 0015 | 0002 | a580 | 0000 | 0000 | 4400 | 0015 | 0002 | a594 | 0007 | 5039 | 8000 | 0000 | 0000 | 0000 | 0007 | 5046 | 8000 | 0000 |
| 1715240 | 0000 | 0000 | 0000 | 0000 | 4400 | 0016 | 0002 | a594 | 0000 | 0000 | 4400 | 0014 | 0002 | a594 | 0007 | 5054 | 8000 | 0000 | 0000 | 0000 | 0007 | 5073 | 0400 | 0000 |
| 1715320 | 0002 | a5b0 | 0007 | 5081 | 0400 | 0000 | 0002 | ac40 | 0007 | 50aa | 0400 | 0000 | 0002 | ad4c | 0007 | 50c1 | 0400 | 0000 | 0002 | ad78 | 0007 | 50d8 | 0400 | 0000 |
| 1715400 | 0002 | abdc | 0007 | 50f8 | 0400 | 0000 | 0002 | adfc | 0007 | 510d | 0400 | 0000 | 0002 | ab9c | 0007 | 512c | 0400 | 0000 | 0002 | a5b0 | 0007 | 513d | 0400 | 0000 |
| 1715460 | 0002 | ada0 | 0007 | 5155 | 0400 | 0000 | 0002 | ab38 | 0007 | 5175 | 0800 | 0000 | 0004 | af00 | 0007 | 5184 | 0400 | 0000 | 0002 | acec | 0007 | 519e | 0400 | 0000 |
| 1715540 | 0002 | ad1c | 0007 | 51b8 | 0400 | 0000 | 0002 | ac74 | 0007 | 51cf | 0400 | 0000 | 0002 | adc8 | 0007 | 51e6 | 0400 | 0000 | 0002 | a714 | 0007 | 51f7 | 0400 | 0000 |
| 1715620 | 0002 | ae2c | 0007 | 5212 | 6400 | 0000 | 0002 | a5b0 | 0007 | 5245 | 6400 | 0000 | 0002 | a5b0 | 0007 | 5253 | 8400 | 0000 | 0002 | a5b0 | 0007 | 5263 | 8000 | 0000 |
| 1715700 | 0000 | 0000 | 0007 | 528d | 8000 | 0000 | 0000 | 0000 | 0007 | 52a7 | 8000 | 0000 | 0000 | 0000 | 0007 | 52d2 | 8000 | 0000 | 0000 | 0000 | 0007 | 52f4 | 8000 | 0000 |
| 1715760 | 0000 | 0000 | 0007 | 5317 | 8000 | 0000 | 0000 | 0000 | 0007 | 533d | 8000 | 0000 | 0000 | 0000 | 0007 | 535f | 8000 | 0000 | 0000 | 0000 | 0007 | 5380 | 8000 | 0000 |
| 1716040 | 0000 | 0000 | 0007 | 5399 | 8000 | 0000 | 0000 | 0000 | 0007 | 53b4 | 8000 | 0000 | 0000 | 0000 | 0007 | 53c8 | 8000 | 0000 | 0000 | 0000 | 0007 | 53da | 8000 | 0004 |
| 1716120 | ffff | fb05 | 0007 | 53f8 | 8000 | 0008 | ffff | fb05 | 0007 | 5435 | 8000 | 0001 | ffff | fb05 | 0007 | 5452 | 8000 | 0004 | ffff | fb05 | 0007 | 5460 | 2000 | 0004 |
| 1716200 | 0000 | 0000 | 0007 | 546d | 2000 | 0004 | 0000 | 0000 | 0007 | 547d | 2000 | 0001 | 0000 | 0000 | 0007 | 549c | 2000 | 0004 | 0000 | 0000 | 0007 | 54a7 | 2000 | 0004 |
| 1716260 | 0000 | 0000 | 0007 | 54b4 | 2000 | 0004 | 0000 | 0000 | 0007 | 54c1 | 2000 | 0001 | 0000 | 0000 | 0007 | 54d0 | 2000 | 0004 | 0000 | 0000 | 0007 | 54de | 2000 | 0004 |

```
1716340 0000 0000 0007 54ec 8000 0004 ffff fb05 0007 54fd 8000 0004 ffff fb05 0007 550b 8000 0004 ffff fb05 0007 551c 8000 0004
1716420 ffff fb05 0007 552d 8000 0004 ffff fb05 0007 55a4 8000 0004 ffff fb05 0007 563c 8000 0004 ffff fb05 0007 5680 8000 0004
1716500 ffff fb05 0007 5700 8000 0004 ffff fb05 0007 577a 8000 0004 ffff fb05 0007 57a8 8000 003c ffff fb05 0007 58bf 8000 003c
1716560 ffff fb05 0007 59bb 2000 0004 0000 0000 0007 59d2 2000 0004 0000 0000 0007 59eb 2000 0004 0000 0000 0007 5a03 2000 0004
1716640 0000 0000 0007 5a18 2000 0004 0000 0000 0007 5a2e 2000 0001 0000 0000 0007 5a47 8000 0000 0000 0000 0007 5b0d 8000 0000
1716720 0000 0000 0007 5bd3 8000 0000 0000 0000 0007 5c93 8000 0000 0000 0000 0007 5ce7 8000 0028 ffff fb05 0007 5e01 8000 0028
1717000 ffff fb05 0007 5e66 8000 0000 0000 0000 0007 5f31 8000 0000 0000 0000 0007 5ffc 8000 0000 0000 0000 0007 60ba 8000 0000
1717060 0000 0000 0007 617e 8000 0000 0000 0000 0007 6243 8000 0000 0000 0000 0007 62a2 8000 0048 ffff fb05 0007 6320 8000 0000
1717140 0000 0000 0007 63e4 8000 0000 0000 0000 0007 64ae 8000 0000 0000 0000 0007 6583 8000 0000 0000 0000 0007 664f 8000 0000
1717220 0000 0000 0007 66ed 8000 0044 ffff fb05 0007 6744 8000 0000 0000 0000 0007 680a 8000 0000 0000 0000 0007 68d5 8000 0000
1717300 0000 0000 0007 69a2 8000 0000 0000 0000 0007 69e4 2400 0044 0002 a5b0 0007 6a04 a000 0044 0000 0044 0007 6a14 a000 0001
1717360 0000 0048 0007 6a20 8400 0000 0002 a5b0 0000 0000 4400 01d1 0002 a5b0 0007 6a3d 4000 0044 0000 0018 0000 0000 4400 01d1
1717440 0002 a5c0 0007 6a4d 8000 0000 0000 0000 0007 6a5a 8000 0000 0000 0000 0000 0000 4400 01d2 0002 a5c0 0000 0000 4400 01d3
1717520 0002 a5f4 0000 0000 4400 01d4 0002 a698 0000 0000 4400 01d6 0002 a6c8 0000 0000 4400 01d8 0002 a6f8 0000 0000 4400 01d9
1717600 0002 a704 0007 6a64 8000 0000 0000 0000 0007 6a79 8000 0050 ffff fb05 0007 6af4 8000 0000 0000 0000 0007 6b7b 2000 0000
1717660 0000 0000 0007 6b9d 2000 0000 0000 0000 0007 6bc0 2000 0000 0000 0000 0007 6bcd 2000 0000 0000 0000 0007 6bda 8000 0001
1717740 ffff fb05 0007 6c14 2000 0004 0000 0000 0007 6c36 2000 0004 0000 0000 0007 6c58 8000 0000 0000 0000 0007 6ce5 2800 0001
1720020 0004 af00 0007 6cfb 8000 0004 ffff fb05 0007 6d07 8000 0008 ffff fb05 0007 6d6a 8000 0000 0000 0000 0007 6de6 8000 0004
1720100 ffff fb05 0007 6e1b 8000 0000 0000 0000 0007 6e6f 8000 0008 ffff fb05 0007 6eda 8000 0000 0000 0000 0007 6f40 8000 0004
1720160 ffff fb05 0007 6f75 8000 0000 0000 0000 0007 6fd1 8000 0008 ffff fb05 0007 7034 8000 0000 0000 0000 0007 709a 8000 0004
1720240 ffff fb05 0007 70cf 8000 0000 0000 0000 0007 712b 8000 0008 ffff fb05 0007 7199 8000 0000 0000 0000 0007 7226 8000 0004
1720320 ffff fb05 0007 725d 8000 0000 0000 0000 0007 72bf 8000 0008 ffff fb05 0007 7315 8000 0000 0000 0000 0007 7396 8000 0004
1720400 ffff fb05 0007 73cd 8000 0000 0000 0000 0007 7425 8000 0008 ffff fb05 0007 747b 8000 0000 0000 0000 0007 74e5 8000 0004
1720460 ffff fb05 0007 751c 8000 0000 0000 0000 0007 757c 8000 0008 ffff fb05 0007 75d2 8000 0000 0000 0000 0007 763c 8000 0004
1720540 ffff fb05 0007 7673 8000 0000 0000 0000 0007 76d3 8000 0008 ffff fb05 0007 772c 8000 0000 0000 0000 0007 77be 8000 0004
1720620 ffff fb05 0007 77f7 8000 0000 0000 0000 0007 785d 8000 0034 ffff fb05 0007 7976 8000 0034 ffff fb05 0007 7a58 8000 0000
1720700 0000 0000 0007 7b22 8000 0000 0000 0000 0007 7b4f 8000 0040 ffff fb05 0007 7c67 8000 0040 ffff fb05 0007 7d81 2000 0004
1720760 0000 0000 0007 7d9b 8000 0000 0000 0000 0007 7e68 8000 0000 0000 0000 0007 7f13 8000 0084 ffff fb05 0007 7f98 8000 0000
1721040 0000 0000 0007 806d 8000 0000 0000 0000 0007 80e9 8000 0004 ffff fb05 0007 80fd 8000 0004 ffff fb05 0007 8139 8000 0004
1721120 ffff fb05 0007 817a 8000 0004 ffff fb05 0007 81b8 8000 0004 ffff fb05 0007 81f3 8000 0004 ffff fb05 0007 8231 8000 0004
1721200 ffff fb05 0007 8253 8000 0004 ffff fb05 0007 8275 2000 0001 0000 0000 0007 8284 8000 0004 ffff fb05 0007 82b3 8000 0000
1721260 0000 0000 0007 8338 2000 0008 0000 0000 0007 8361 8000 0008 ffff fb05 0007 836c 8000 0008 ffff fb05 0007 8378 8000 0008
1721340 ffff fb05 0007 8384 8000 0008 ffff fb05 0007 83d0 8000 0000 0000 0000 0007 8496 8000 0000 0000 0000 0007 84f8 8000 0044
1721420 ffff fb05 0007 855a 8000 0000 0000 0000 0007 8620 8000 0000 0000 0000 0007 864b 8000 0008 ffff fb05 0007 8657 8000 000c
1721500 ffff fb05 0007 86ca 8000 0000 0000 0000 0007 8756 8000 0008 ffff fb05 0007 87aa 8000 0000 0000 0000 0007 882a 8000 000c
1721560 ffff fb05 0007 88a0 8000 0000 0000 0000 0007 894b 2000 0008 0000 0000 0007 8976 8000 000c ffff fb05 0007 89da 8000 0000
1721640 0000 0000 0007 8a9b 8000 0000 0000 0000 0007 8b0b 2000 0008 0000 0000 0007 8b32 8000 000c ffff fb05 0007 8b97 8000 0000
1721720 0000 0000 0007 8c65 8000 0000 0000 0000 0007 8cd3 2000 0008 0000 0000 0007 8cfb 8000 0008 ffff fb05 0007 8d5c 8000 0000
1722000 0000 0000 0007 8e03 8000 0010 ffff fb05 0007 8e93 8000 0000 0000 0000 0007 8f44 8000 0018 ffff fb05 0007 8fd4 8000 0000
1722060 0000 0000 0007 90a4 8000 0000 0000 0000 0007 912c 2000 0008 0000 0000 0007 9155 8000 0024 ffff fb05 0007 92a2 8000 0000
1722140 0000 0000 0007 9362 8000 0000 0000 0000 0007 93f6 8000 0004 ffff fb05 0007 943f 8000 0000 0000 0000 0007 9452 8000 0010
1722220 ffff fb05 0007 94db 8000 0000 0000 0000 0007 959f 8000 0000 0000 0000 0007 965e 8000 0000 0000 0000 0007 9675 2000 0008
1722300 0000 0000 0007 96a0 8000 003c ffff fb05 0007 97a8 8000 003c ffff fb05 0007 9833 8000 0000 0000 0000 0007 98f6 8000 0000
1722360 0000 0000 0007 99c8 8000 0000 0000 0000 0007 9a93 8000 0000 0000 0000 0007 9b6f 8000 0000 0000 0000 0007 9c49 8000 0000
1722440 0000 0000 0007 9d10 8000 0000 0000 0000 0007 9d5e 2000 0008 0000 0000 0007 9d8a 8000 001c ffff fb05 0007 9e2e 8000 0000
1722520 0000 0000 0007 9f06 8000 0000 0000 0000 0007 9fda 8000 0000 0000 0000 0007 a0b0 8000 0000 0000 0000 0007 a0d3 2000 0008
1722600 0000 0000 0007 a107 8000 003c ffff fb05 0007 a208 8000 003c ffff fb05 0007 a26d 8000 0000 0000 0000 0007 a333 8000 0000
1722660 0000 0000 0007 a3f0 8000 0000 0000 0000 0007 a483 2000 0008 0000 0000 0007 a4ac 8000 008c ffff fb05 0007 a5a7 8000 008c
1722740 ffff fb05 0007 a64d 8000 0000 0000 0000 0007 a71a 8000 0000 0000 0000 0007 a7d7 8000 0000 0000 0000 0007 a8a6 8000 0000
1723020 0000 0000 0007 a92c 2000 0008 0000 0000 0007 a954 2400 003c 0002 a714 0007 a975 a000 003c 0000 0044 0007 a986 8400 0000
1723100 0002 a714 0000 0000 4400 0010 0002 a714 0007 a9ba 4000 003c 0000 0018 0000 0000 4400 0010 0002 a720 0007 a9cb 8000 0000
1723160 0000 0000 0000 0000 4400 000f 0002 a720 0000 0000 4400 0010 0002 a828 0000 0000 4400 0011 0002 a82c 0000 0000 4400 0012
1723240 0002 a830 0000 0000 4400 0010 0002 a834 0000 0000 4400 0028 0002 a848 0000 0000 4400 0029 0002 a854 0007 a9d8 8000 0000
1723320 0000 0000 0007 a9ed 8000 0034 ffff fb05 0007 ab3f 8000 0000 0000 0000 0007 ac00 8000 0000 0000 0000 0007 acc1 8000 0000
1723400 0000 0000 0007 ad79 2000 0008 0000 0000 0007 ada7 8000 0018 ffff fb05 0007 ae3a 8000 0000 0000 0000 0007 af02 8000 0000
```

| | | | | | | | | | | | | | | | | | | | | | | | | |
|---|---|---|---|---|---|---|---|---|---|---|---|---|---|---|---|---|---|---|---|---|---|---|---|---|
| 1723460 | 0000 | 0000 | 0007 | af38 | 2000 | 0008 | 0000 | 0000 | 0007 | af63 | 8000 | 002c | ffff | fb05 | 0007 | b018 | 8000 | 0000 | 0000 | 0000 | 0007 | b0eb | 8000 | 0000 |
| 1723540 | 0000 | 0000 | 0007 | b177 | 2000 | 0008 | 0000 | 000c | 0007 | b1a3 | 8000 | 000c | ffff | fb05 | 0007 | b231 | 8000 | 0000 | 0000 | 0000 | 0007 | b300 | 8000 | 0000 |
| 1723620 | 0000 | 0000 | 0007 | b31e | 8000 | 0030 | ffff | fb05 | 0007 | b449 | 8000 | 0030 | ffff | fb05 | 0007 | b48e | 8000 | 0000 | 0000 | 0000 | 0007 | b551 | 8000 | 0000 |
| 1723700 | 0000 | 0000 | 0007 | b5a9 | 2000 | 0008 | 0000 | 0000 | 0007 | b5d8 | 2000 | 0001 | 0000 | 0000 | 0007 | b5e7 | 2000 | 000c | 0000 | 0000 | 0007 | b5fc | 2400 | 0001 |
| 1723760 | 0002 | a864 | 0007 | b61d | a000 | 0030 | 0000 | 0044 | 0007 | b637 | 8400 | 0000 | 0002 | a864 | 0000 | 0000 | 4400 | 0019 | 0002 | a864 | 0007 | b647 | 4000 | 0030 |
| 1724040 | 0000 | 0018 | 0000 | 0000 | 4400 | 0019 | 0002 | a870 | 0007 | b658 | 8000 | 0004 | ffff | fffc | 0000 | 0000 | c000 | 0002 | 0000 | 02c0 | 0007 | b66f | 8000 | 0000 |
| 1724120 | 0000 | 0000 | 0000 | 0000 | 4400 | 001a | 0002 | a870 | 0000 | 0000 | 4400 | 001b | 0002 | a878 | 0000 | 0000 | 4400 | 001c | 0002 | a898 | 0000 | 0000 | 4400 | 001d |
| 1724200 | 0002 | a8a8 | 0000 | 0000 | 4400 | 001e | 0002 | a8c8 | 0000 | 0000 | 4400 | 001f | 0002 | a8d8 | 0000 | 0000 | 4400 | 0020 | 0002 | a8f8 | 0000 | 0000 | 4400 | 0022 |
| 1724260 | 0002 | a908 | 0000 | 0000 | 4400 | 0023 | 0002 | a928 | 0000 | 0000 | e000 | 0002 | 0000 | 0388 | 0000 | 0000 | 4400 | 0025 | 0002 | a938 | 0007 | b67c | 8000 | 0000 |
| 1724340 | 0000 | 0000 | 0007 | b69b | 2400 | 0001 | 0002 | a948 | 0007 | b6ca | a000 | 0030 | 0000 | 0044 | 0007 | b6db | a000 | 0008 | 0000 | 0048 | 0000 | 0000 | 4400 | 002b |
| 1724420 | 0002 | a948 | 0007 | b6e8 | 4000 | 0030 | 0000 | 0018 | 0000 | 0000 | 4400 | 002b | 0002 | a958 | 0007 | b6f9 | 8000 | 008c | ffff | fffc | 0007 | b70f | 8000 | 000c |
| 1724500 | ffff | fff8 | 0007 | b728 | 8000 | 0004 | ffff | fff4 | 0000 | 0000 | c000 | 0002 | 0000 | 03a8 | 0007 | b73f | 8000 | 0000 | 0000 | 0000 | 0000 | 0000 | 4400 | 003d |
| 1724560 | 0002 | a958 | 0007 | b74c | 8000 | 0000 | 0000 | 0000 | 0000 | 0000 | 4400 | 003e | 0002 | a958 | 0007 | b756 | 8000 | 0000 | 0000 | 0000 | 0000 | 0000 | 4400 | 003f |
| 1724640 | 0002 | a958 | 0007 | b760 | 8000 | 0000 | 0000 | 0000 | 0000 | 0000 | 4400 | 0040 | 0002 | a958 | 0000 | 0000 | 4400 | 002c | 0002 | a958 | 0000 | 0000 | 4400 | 002e |
| 1724720 | 0002 | a960 | 0000 | 0000 | 4400 | 002f | 0002 | a980 | 0000 | 0000 | 4400 | 0030 | 0002 | a9cc | 0000 | 0000 | 4400 | 0032 | 0002 | a9d4 | 0000 | 0000 | 4400 | 0033 |
| 1725000 | 0002 | a9e4 | 0000 | 0000 | 4400 | 0036 | 0002 | a9f0 | 0000 | 0000 | 4400 | 0037 | 0002 | aa00 | 0000 | 0000 | 4400 | 0038 | 0002 | aa20 | 0000 | 0000 | 4400 | 0039 |
| 1725060 | 0002 | aa40 | 0000 | 0000 | e000 | 0002 | 0000 | 04a0 | 0000 | 0000 | 4400 | 003b | 0002 | aa50 | 0007 | b76e | 8000 | 0000 | 0000 | 0000 | 0007 | b79b | 2400 | 0001 |
| 1725140 | 0002 | aa60 | 0007 | b7cf | a000 | 0030 | 0000 | 0044 | 0007 | b7e0 | a000 | 0001 | 0000 | 0048 | 0000 | 0000 | 4400 | 0041 | 0002 | aa60 | 0007 | b7f0 | 4000 | 0030 |
| 1725220 | 0000 | 0018 | 0000 | 0000 | 4400 | 0041 | 0002 | aa70 | 0007 | b801 | 8000 | 0000 | 0000 | 0000 | 0007 | b80e | 8000 | 0000 | 0000 | 0000 | 0000 | 0000 | 4400 | 0042 |
| 1725300 | 0002 | aa70 | 0000 | 0000 | 4400 | 0046 | 0002 | aa78 | 0000 | 0000 | 4400 | 0047 | 0002 | aac0 | 0000 | 0000 | 4400 | 0048 | 0002 | aacc | 0007 | b81b | 8000 | 0000 |
| 1725360 | 0000 | 0000 | 0007 | b84c | 2400 | 0001 | 0002 | aadc | 0007 | b874 | 8400 | 0000 | 0002 | aadc | 0000 | 0000 | 4400 | 023b | 0002 | aadc | 0000 | 0000 | 4400 | 023b |
| 1725440 | 0002 | aae8 | 0000 | 0000 | 4400 | 023c | 0002 | aaf8 | 0007 | b891 | 2400 | 0001 | 0002 | ab08 | 0000 | 0000 | 4400 | 023b | 0002 | ab08 | 0000 | 0000 | 4400 | 023b |
| 1725520 | 0002 | ab14 | 0000 | 0000 | 4400 | 023c | 0002 | ab28 | 0007 | b8b9 | 2000 | 0008 | 0000 | 0000 | 0007 | b8eb | 2000 | 0008 | 0000 | 0000 | 0007 | b934 | 2000 | 0008 |
| 1725600 | 0000 | 0000 | 0007 | b973 | 2400 | 0001 | 0002 | ab38 | 0007 | b999 | a000 | 0030 | 0000 | 0044 | 0007 | b9aa | a000 | 0001 | 0000 | 0048 | 0007 | b9b7 | 8400 | 0000 |
| 1725660 | 0002 | ab38 | 0000 | 0000 | 4400 | 000a | 0002 | ab38 | 0000 | 0000 | 4400 | 000a | 0002 | ab4c | 0007 | b9cd | 8000 | 0000 | 0000 | 0000 | 0007 | b9da | 8000 | 0000 |
| 1725740 | 0000 | 0000 | 0000 | 0000 | 4400 | 000b | 0002 | ab4c | 0000 | 0000 | 4400 | 0009 | 0002 | ab4c | 0000 | 0000 | 4400 | 000a | 0002 | ab60 | 0000 | 0000 | 4400 | 0009 |
| 1726020 | 0002 | ab8c | 0007 | b9e4 | 8000 | 0000 | 0000 | 0000 | 0007 | ba08 | 2400 | 0001 | 0002 | ab9c | 0007 | ba2d | a000 | 0018 | 0000 | 0044 | 0007 | ba47 | a000 | 0001 |
| 1726100 | 0000 | 0048 | 0007 | ba54 | 8400 | 0000 | 0002 | ab9c | 0007 | ba88 | 4000 | 0018 | 0000 | 0018 | 0000 | 0000 | 4400 | 0009 | 0002 | abac | 0007 | ba99 | 8000 | 0000 |
| 1726160 | 0000 | 0000 | 0007 | baa6 | 8000 | 0000 | 0000 | 0000 | 0000 | 0000 | 4400 | 000a | 0002 | abac | 0000 | 0000 | 4400 | 0008 | 0002 | abac | 0000 | 0000 | 4400 | 0009 |
| 1726240 | 0002 | abbc | 0000 | 0000 | 4400 | 000a | 0002 | abcc | 0007 | bab0 | 8000 | 0000 | 0000 | 0000 | 0007 | bad3 | 2400 | 0001 | 0002 | abdc | 0007 | baf9 | a000 | 001c |
| 1726320 | 0000 | 0044 | 0007 | bb12 | a000 | 0001 | 0000 | 0048 | 0007 | bb1f | 8400 | 0000 | 0002 | abdc | 0000 | 0000 | 4400 | 001c | 0002 | abdc | 0007 | bb56 | 4000 | 001c |
| 1726400 | 0000 | 0018 | 0000 | 0000 | 4400 | 001c | 0002 | abec | 0007 | bb67 | 8000 | 0000 | 0000 | 0000 | 0007 | bb74 | 8000 | 0000 | 0000 | 0000 | 0000 | 0000 | 4400 | 001d |
| 1726460 | 0002 | abec | 0000 | 0000 | 4400 | 001c | 0002 | abec | 0000 | 0000 | 4400 | 001d | 0002 | ac30 | 0007 | bb7e | 8000 | 0000 | 0000 | 0000 | 0007 | bba2 | 2400 | 0001 |
| 1726540 | 0002 | ac40 | 0007 | bbd1 | a000 | 003c | 0000 | 0044 | 0007 | bbe1 | a000 | 0001 | 0000 | 0048 | 0007 | bbee | 8400 | 0000 | 0002 | ac40 | 0000 | 0000 | 4400 | 002e |
| 1726620 | 0002 | ac40 | 0007 | bc25 | 4000 | 003c | 0000 | 0018 | 0000 | 0000 | 4400 | 002e | 0002 | ac50 | 0007 | bc35 | 8000 | 0000 | 0000 | 0000 | 0007 | bc42 | 8000 | 0000 |
| 1726700 | 0000 | 0000 | 0000 | 0000 | 4400 | 002f | 0002 | ac50 | 0000 | 0000 | 4400 | 002d | 0002 | ac50 | 0007 | bc4c | 8000 | 0000 | 0000 | 0000 | 0007 | bc79 | 2400 | 0001 |
| 1726760 | 0002 | ac74 | 0007 | bc96 | a000 | 000c | 0000 | 0044 | 0007 | bcaf | a000 | 0001 | 0000 | 0048 | 0007 | bcbc | 8400 | 0000 | 0002 | ac74 | 0000 | 0000 | 4400 | 0012 |
| 1727040 | 0002 | ac74 | 0007 | bcf0 | 4000 | 000c | 0000 | 0018 | 0000 | 0000 | 4400 | 0012 | 0002 | ac84 | 0007 | bd01 | 8000 | 0000 | 0000 | 0000 | 0007 | bd0e | 8000 | 0000 |
| 1727120 | 0000 | 0000 | 0000 | 0000 | 4400 | 0013 | 0002 | ac84 | 0000 | 0000 | 4400 | 0011 | 0002 | ac84 | 0000 | 0000 | 4400 | 0012 | 0002 | aca8 | 0000 | 0000 | 4400 | 0013 |
| 1727200 | 0002 | acdc | 0007 | bd18 | 8000 | 0000 | 0000 | 0000 | 0007 | bd33 | 2400 | 0004 | 0002 | acec | 0007 | bd53 | a000 | 0008 | 0000 | 0044 | 0007 | bd63 | a000 | 0004 |
| 1727260 | 0000 | 0048 | 0007 | bd7d | 8400 | 0000 | 0002 | acec | 0000 | 0000 | 4400 | 001b | 0002 | acec | 0000 | 0000 | 4400 | 001b | 0002 | ad00 | 0007 | bdb0 | 8000 | 0000 |
| 1727340 | 0000 | 0000 | 0007 | bdbd | 8000 | 0000 | 0000 | 0000 | 0000 | 0000 | 4400 | 001c | 0002 | ad00 | 0000 | 0000 | 4400 | 001a | 0002 | ad00 | 0007 | bdcb | 8000 | 0000 |
| 1727420 | 0000 | 0000 | 0007 | bde9 | 2400 | 0004 | 0002 | ad1c | 0007 | be09 | a000 | 0008 | 0000 | 0044 | 0007 | be19 | a000 | 0004 | 0000 | 0048 | 0000 | 0000 | 4400 | 001a |
| 1727500 | 0002 | ad30 | 0007 | be2b | 8000 | 0000 | 0000 | 0000 | 0007 | be38 | 8000 | 0000 | 0000 | 0000 | 0000 | 0000 | 4400 | 001b | 0002 | ad30 | 0000 | 0000 | 4400 | 0019 |
| 1727560 | 0002 | ad30 | 0007 | be46 | 8000 | 0000 | 0000 | 0000 | 0007 | be64 | 2400 | 0001 | 0002 | ad4c | 0007 | be81 | a000 | 0008 | 0000 | 0044 | 0007 | be91 | a000 | 0001 |
| 1727640 | 0000 | 0048 | 0007 | bea2 | a000 | 0008 | 0000 | 004c | 0000 | 0000 | 4400 | 0019 | 0002 | ad68 | 0007 | beb3 | 8000 | 0000 | 0000 | 0000 | 0007 | bec0 | 8000 | 0000 |
| 1727720 | 0000 | 0000 | 0000 | 0000 | 4400 | 001a | 0002 | ad68 | 0007 | bece | 8000 | 0000 | 0000 | 0000 | 0000 | 0000 | 4400 | 001b | 0002 | ad68 | 0000 | 0000 | 4400 | 0018 |
| 1730000 | 0002 | ad68 | 0007 | bedc | 8000 | 0000 | 0000 | 0000 | 0007 | bef7 | 2400 | 0001 | 0002 | ad78 | 0007 | bf14 | a000 | 0008 | 0000 | 0044 | 0007 | bf24 | a000 | 0001 |
| 1730060 | 0000 | 0048 | 0007 | bf35 | a000 | 0004 | 0000 | 004c | 0000 | 0000 | 4400 | 0018 | 0002 | ad90 | 0007 | bf45 | 8000 | 0000 | 0000 | 0000 | 0007 | bf52 | 8000 | 0000 |
| 1730140 | 0000 | 0000 | 0000 | 0000 | 4400 | 0019 | 0002 | ad90 | 0007 | bf60 | 8000 | 0000 | 0000 | 0000 | 0000 | 0000 | 4400 | 001a | 0002 | ad90 | 0000 | 0000 | 4400 | 0017 |
| 1730220 | 0002 | ad90 | 0007 | bf6e | 8000 | 0000 | 0000 | 0000 | 0007 | bf89 | 2400 | 0001 | 0002 | ada0 | 0007 | bfa7 | a000 | 0008 | 0000 | 0044 | 0007 | bfb7 | a000 | 0001 |
| 1730300 | 0000 | 0048 | 0007 | bfc9 | a000 | 0001 | 0000 | 004c | 0000 | 0000 | 4400 | 0017 | 0002 | adb8 | 0007 | bfd9 | 8000 | 0000 | 0000 | 0000 | 0007 | bfe6 | 8000 | 0000 |
| 1730360 | 0000 | 0000 | 0000 | 0000 | 4400 | 0018 | 0002 | adb8 | 0007 | bff4 | 8000 | 0000 | 0000 | 0000 | 0000 | 0000 | 4400 | 0019 | 0002 | adb8 | 0000 | 0000 | 4400 | 0016 |
| 1730440 | 0002 | adb8 | 0007 | c002 | 8000 | 0000 | 0000 | 0000 | 0007 | c01e | 2400 | 0001 | 0002 | adc8 | 0007 | c03c | a000 | 0008 | 0000 | 0044 | 0007 | c04c | a000 | 0001 |
| 1730520 | 0000 | 0048 | 0007 | c05d | a000 | 0004 | 0000 | 004c | 0000 | 0000 | 4400 | 0016 | 0002 | ade0 | 0007 | c06d | 8000 | 0000 | 0000 | 0000 | 0007 | c07a | 8000 | 0000 |

```
1730600  0000 0000 0000 0000 4400 0017 0002 ade0 0007 c088 8000 0000 0000 0000 0000 0000 4400 0018 0002 a1e0 0000 0000 4400 0015
1730660  0002 ade0 0007 c096 8000 0000 0000 0000 0007 c0b1 2400 0001 0002 a1fc 0007 c0cd a000 0008 0000 0044 0007 c0dd a000 0004
1730740  0000 0048 0000 0000 4400 0015 0002 ae10 0007 c0ed 8000 0000 0000 0000 0007 c0fa 8000 0000 0000 0000 0000 0000 4400 0016
1731020  0002 ae10 0000 0000 4400 0014 0002 ae10 0007 c109 8000 0000 0000 0000 0007 c121 2400 0004 0002 ae2c 0007 c142 a000 0004
1731100  0000 0044 0007 c153 a000 0004 0000 0048 0007 c165 8400 0000 0002 ae2c 0000 0000 4400 0015 0002 ae2c 0000 0000 4400 0015
1731160  0002 ae40 0007 c197 8000 0000 0000 0000 0007 c1a4 8000 0000 0000 0000 0000 0000 4400 0016 0002 ae40 0000 0000 4400 0014
1731240  0002 ae40 0007 c1b2 8000 0000 0000 0000 0007 c1i1 0400 0000 0002 ae60 0007 c1d8 0400 0000 0002 b4f8 0007 c201 0400 0000
1731320  0002 b604 0007 c218 0400 0000 0002 b630 0007 c22f 0400 0000 0002 b494 0007 c24f 0400 0000 0002 b6b4 0007 c264 0400 0000
1731400  0002 b454 0007 c283 0400 0000 0002 ae60 0007 c294 0400 0000 0002 b658 0007 c2ac 0400 0000 0002 b3f0 0007 c2c4 0800 0000
1731460  0004 af08 0007 c2d3 0400 0000 0002 b5a4 0007 c2ed 0400 0000 0002 b5d4 0007 c307 0400 0000 0002 b52c 0007 c31e 0400 0000
1731540  0002 b680 0007 c335 0400 0000 0002 afc4 0007 c346 0400 0000 0002 b6e4 0007 c361 6400 0000 0002 ae60 0007 c394 6400 0000
1731620  0002 ae60 0007 c39b 8400 0000 0002 ae60 0007 c3a4 8000 0000 0000 0000 0007 c3ce 8000 0000 0000 0000 0007 c3e8 8000 0000
1731700  0000 0000 0007 c413 8000 0000 0000 0000 0007 c435 8000 0000 0000 0000 0007 c458 8000 0000 0000 0000 0007 c47e 8000 0000
1731760  0000 0000 0007 c4a0 8000 0000 0000 0000 0007 c4c1 8000 0000 0000 0000 0007 c4da 8000 0000 0000 0000 0007 c4f5 8000 0000
1732040  0000 0000 0007 c509 8000 0000 0000 0000 0007 c51b 8000 0004 ffff fb05 0007 c539 8000 0008 ffff fb05 0007 c576 8000 0001
1732120  ffff fb05 0007 c593 8000 0004 ffff fb05 0007 c5a1 2000 0004 0000 0000 0007 c5ae 2000 0004 0000 0000 0007 c5be 2000 0001
1732200  0000 0000 0007 c5d1 2000 0004 0000 0000 0007 c5e8 2000 0004 0000 0000 0007 c5f5 2000 0004 0000 0000 0007 c602 2000 0001
1732260  0000 0000 0007 c611 2000 0004 0000 0000 0007 c61f 2000 0004 0000 0000 0007 c62d 8000 0004 ffff fb05 0007 c63e 8000 0004
1732340  ffff fb05 0007 c64c 8000 0004 ffff fb05 0007 c65d 8000 0004 ffff fb05 0007 c66e 8000 0004 ffff fb05 0007 c6e5 8000 0004
1732420  ffff fb05 0007 c77d 8000 0004 ffff fb05 0007 c7c1 8000 0004 ffff fb05 0007 c841 8000 0004 ffff fb05 0007 c8bb 8000 0004
1732500  ffff fb05 0007 c8e9 8000 003c ffff fb05 0007 ca00 8000 003c ffff fb05 0007 cafc 2000 0004 0000 0000 0007 cb13 2000 0004
1732560  0000 0000 0007 cb2c 2000 0004 0000 0000 0007 cb44 2000 0004 0000 0000 0007 cb59 2000 0004 0000 0000 0007 cb6f 2000 0001
1732640  0000 0000 0007 cb88 8000 0000 0000 0000 0007 cc4e 8000 0000 0000 0000 0007 cd14 8000 0000 0000 0000 0007 cdd4 8000 0000
1732720  0000 0000 0007 ce28 8000 0028 ffff fb05 0007 cf42 8000 0028 ffff fb05 0007 cfa7 8000 0000 0000 0000 0007 d072 8000 0000
1733000  0000 0000 0007 d13d 8000 0000 0000 0000 0007 d1fb 8000 0000 0000 0000 0007 d2bf 8000 0000 0000 0000 0007 d384 8000 0000
1733060  0000 0000 0007 d3e3 8000 0048 ffff fb05 0007 d461 8000 0000 0000 0000 0007 d525 8000 0000 0000 0000 0007 d5ef 8000 0000
1733140  0000 0000 0007 d6c4 8000 0000 0000 0000 0007 d790 8000 0000 0000 0000 0007 d82e 8000 0044 ffff fb05 0007 d885 8000 0000
1733220  0000 0000 0007 d94b 8000 0000 0000 0000 0007 da16 8000 0000 0000 0000 0007 dae3 8000 0000 0000 0000 0007 db25 2400 0044
1733300  0002 ae60 0007 db45 a000 0044 0000 0044 0007 db55 a000 0001 0000 0048 0007 db61 8400 0000 0002 ae60 0000 0000 4400 01d1
1733360  0002 ae60 0007 db7e 4000 0044 0000 0018 0000 0000 4400 01d1 0002 ae70 0007 db8e 8000 0000 0000 0000 0007 db9b 8000 0000
1733440  0000 0000 0000 0000 4400 01d2 0002 ae70 0000 0000 4400 01d3 0002 aea4 0000 0000 4400 01d4 0002 af48 0000 0000 4400 01d6
1733520  0002 af78 0000 0000 4400 01d8 0002 afa8 0000 0000 4400 01d9 0002 afb4 0007 dba5 8000 0000 0000 0000 0007 dbba 8000 0050
1733600  ffff fb05 0007 dc35 8000 0000 0000 0000 0007 dcbc 2000 0000 0000 0000 0007 dcde 2000 0000 0000 0000 0007 dd01 2000 0000
1733660  0000 0000 0007 dd0e 2000 0000 0000 0000 0007 dd1b 8000 0001 ffff fb05 0007 dd55 2000 0004 0000 0000 0007 dd77 2000 0004
1733740  0000 0000 0007 dd99 8000 0000 0000 0000 0007 de26 2800 0001 0004 af08 0007 de3c 8000 0004 ffff fb05 0007 de48 8000 0008
1734020  ffff fb05 0007 deab 8000 0000 0000 0000 0007 df27 8000 0004 ffff fb05 0007 df5c 8000 0000 0000 0000 0007 dfb0 8000 0008
1734100  ffff fb05 0007 e01b 8000 0000 0000 0000 0007 e081 8000 0004 ffff fb05 0007 e0b6 8000 0000 0000 0000 0007 e112 8000 0008
1734160  ffff fb05 0007 e175 8000 0000 0000 0000 0007 e1db 8000 0004 ffff fb05 0007 e210 8000 0000 0000 0000 0007 e26c 8000 0008
1734240  ffff fb05 0007 e2da 8000 0000 0000 0000 0007 e367 8000 0004 ffff fb05 0007 e39e 8000 0000 0000 0000 0007 e400 8000 0008
1734320  ffff fb05 0007 e456 8000 0000 0000 0000 0007 e4d7 8000 0004 ffff fb05 0007 e50e 8000 0000 0000 0000 0007 e566 8000 0008
1734400  ffff fb05 0007 e5bc 8000 0000 0000 0000 0007 e626 8000 0004 ffff fb05 0007 e65d 8000 0000 0000 0000 0007 e6bd 8000 0008
1734460  ffff fb05 0007 e713 8000 0000 0000 0000 0007 e77d 8000 0004 ffff fb05 0007 e7b4 8000 0000 0000 0000 0007 e814 8000 0008
1734540  ffff fb05 0007 e86d 8000 0000 0000 0000 0007 e8ff 8000 0004 ffff fb05 0007 e938 8000 0000 0000 0000 0007 e99e 8000 0034
1734620  ffff fb05 0007 eab7 8000 0034 ffff fb05 0007 eb99 8000 0000 0000 0000 0007 ec63 8000 0000 0000 0000 0007 ec90 8000 0040
1734700  ffff fb05 0007 eda8 8000 0040 ffff fb05 0007 eec2 2000 0004 0000 0000 0007 eedc 8000 0000 0000 0000 0007 efa9 8000 0000
1734760  0000 0000 0007 f054 8000 0084 ffff fb05 0007 f0d9 8000 0000 0000 0000 0007 f1ae 8000 0000 0000 0000 0007 f22a 8000 0004
1735040  ffff fb05 0007 f23e 8000 0004 ffff fb05 0007 f27a 8000 0004 ffff fb05 0007 f2bb 8000 0004 ffff fb05 0007 f2f9 8000 0004
1735120  ffff fb05 0007 f334 8000 0004 ffff fb05 0007 f372 8000 0004 ffff fb05 0007 f394 8000 0004 ffff fb05 0007 f3b6 2000 0001
1735200  0000 0000 0007 f3c5 8000 0004 ffff fb05 0007 f3f4 8000 0000 0000 0000 0007 f479 2000 0008 0000 0000 0007 f49b 8000 0008
1735260  ffff fb05 0007 f4a6 8000 0008 ffff fb05 0007 f4b2 8000 0008 ffff fb05 0007 f4be 8000 0008 ffff fb05 0007 f50a 8000 0000
1735340  0000 0000 0007 f5d0 8000 0000 0000 0000 0007 f632 8000 0044 ffff fb05 0007 f694 8000 0000 0000 0000 0007 f75a 8000 0000
1735420  0000 0000 0007 f785 8000 0008 ffff fb05 0007 f791 8000 000c ffff fb05 0007 f804 8000 0000 0000 0000 0007 f890 8000 0008
1735500  ffff fb05 0007 f8e4 8000 0000 0000 0000 0007 f964 8000 000c ffff fb05 0007 f9da 8000 0000 0000 0000 0007 fa85 2000 0008
1735560  0000 0000 0007 faa9 8000 000c ffff fb05 0007 fb0d 8000 0000 0000 0000 0007 fbce 8000 0000 0000 0000 0007 fc3e 2000 0008
1735640  0000 0000 0007 fc5e 8000 000c ffff fb05 0007 fcc3 8000 0000 0000 0000 0007 fd91 8000 0000 0000 0000 0007 fdff 2000 0008
```

| | | | | | | | | | | | | | | | | | | | | | | | | |
|---|---|---|---|---|---|---|---|---|---|---|---|---|---|---|---|---|---|---|---|---|---|---|---|---|
| 1735720 | 0000 | 0000 | 0007 | fe20 | 8000 | 0008 | ffff | fb05 | 0007 | fe81 | 8000 | 0000 | 0000 | 0000 | 0007 | ff28 | 8000 | 0010 | ffff | fb05 | 0007 | ffb8 | 8000 | 0000 |
| 1736000 | 0000 | 0000 | 0008 | 0069 | 8000 | 0018 | ffff | fb05 | 0008 | 00f9 | 8000 | 0000 | 0000 | 0000 | 0008 | 01c9 | 8000 | 0000 | 0000 | 0000 | 0008 | 0251 | 2000 | 0008 |
| 1736060 | 0000 | 0000 | 0008 | 0273 | 8000 | 0024 | ffff | fb05 | 0008 | 03c0 | 8000 | 0000 | 0000 | 0000 | 0008 | 0480 | 8000 | 0000 | 0000 | 0000 | 0008 | 0514 | 8000 | 0004 |
| 1736140 | ffff | fb05 | 0008 | 055d | 8000 | 0000 | 0000 | 0000 | 0008 | 0570 | 8000 | 0010 | ffff | fb05 | 0008 | 05f9 | 8000 | 0000 | 0000 | 0000 | 0008 | 06bd | 8000 | 0000 |
| 1736220 | 0000 | 0000 | 0008 | 077c | 8000 | 0000 | 0000 | 0000 | 0008 | 0793 | 2000 | 0008 | 0000 | 0000 | 0008 | 07b7 | 8000 | 003c | ffff | fb05 | 0008 | 09bf | 8000 | 003c |
| 1736300 | ffff | fb05 | 0008 | 094a | 8000 | 0000 | 0000 | 0000 | 0008 | 0a0d | 8000 | 0000 | 0000 | 0000 | 0008 | 0adf | 8000 | 0000 | 0000 | 0000 | 0008 | 0baa | 8000 | 0000 |
| 1736360 | 0000 | 0000 | 0008 | 0c86 | 8000 | 0000 | 0000 | 0000 | 0008 | 0160 | 8000 | 0000 | 0000 | 0000 | 0008 | 0e27 | 8000 | 0000 | 0000 | 0000 | 0008 | 0e75 | 2000 | 0008 |
| 1736440 | 0000 | 0000 | 0008 | 0e9a | 8000 | 001c | ffff | fb05 | 0008 | 0f3e | 8000 | 0000 | 0000 | 0000 | 0008 | 1016 | 8000 | 0000 | 0000 | 0000 | 0008 | 10ea | 8000 | 0000 |
| 1736520 | 0000 | 0000 | 0008 | 11c0 | 8000 | 0000 | 0000 | 0000 | 0008 | 11e3 | 2000 | 0008 | 0000 | 0000 | 0008 | 1210 | 8000 | 003c | ffff | fb05 | 0008 | 1311 | 8000 | 003c |
| 1736600 | ffff | fb05 | 0008 | 1376 | 8000 | 0000 | 0000 | 0000 | 0008 | 143c | 8000 | 0000 | 0000 | 0000 | 0008 | 14f9 | 8000 | 0000 | 0000 | 0000 | 0008 | 158c | 2000 | 0008 |
| 1736660 | 0000 | 0000 | 0008 | 15ae | 8000 | 008c | ffff | fb05 | 0008 | 16a9 | 8000 | 008c | ffff | fb05 | 0008 | 174f | 8000 | 0000 | 0000 | 0000 | 0008 | 181c | 8000 | 0000 |
| 1736740 | 0000 | 0000 | 0008 | 19d9 | 8000 | 0000 | 0000 | 0000 | 0008 | 19a8 | 8000 | 0000 | 0000 | 0000 | 0008 | 1a2e | 2000 | 0008 | 0000 | 0000 | 0008 | 1a4f | 2400 | 003c |
| 1737020 | 0002 | afc4 | 0008 | 1a70 | a000 | 003c | 0000 | 0044 | 0008 | 1a81 | 8400 | 0000 | 0002 | afc4 | 0000 | 0000 | 4400 | 0010 | 0002 | afc4 | 0008 | 1ab5 | 4000 | 003c |
| 1737100 | 0000 | 0018 | 0000 | 0000 | 4400 | 0010 | 0002 | afd0 | 0008 | 1ac6 | 8000 | 0000 | 0000 | 0000 | 0000 | 0000 | 4400 | 000f | 0002 | afd0 | 0000 | 0000 | 4400 | 0010 |
| 1737160 | 0002 | b0d8 | 0000 | 0000 | 4400 | 0011 | 0002 | b0dc | 0000 | 0000 | 4400 | 0012 | 0002 | b0e0 | 0000 | 0000 | 4400 | 0010 | 0002 | b0e4 | 0000 | 0000 | 4400 | 0028 |
| 1737240 | 0002 | b0f8 | 0000 | 0000 | 4400 | 0029 | 0002 | b104 | 0008 | 1ad3 | 8000 | 0000 | 0000 | 0000 | 0008 | 1ae8 | 8000 | 0034 | ffff | fb05 | 0008 | 1c3a | 8000 | 0000 |
| 1737320 | 0000 | 0000 | 0008 | 1cfb | 8000 | 0000 | 0000 | 0000 | 0008 | 1dbc | 6000 | 0000 | 0000 | 0000 | 0008 | 1e74 | 2000 | 0008 | 0000 | 0000 | 0008 | 1e9b | 8000 | 0018 |
| 1737400 | ffff | fb05 | 0008 | 1f2e | 8000 | 0000 | 0000 | 0000 | 0008 | 1ff6 | 8000 | 0000 | 0000 | 0000 | 0008 | 202c | 2000 | 0008 | 0000 | 0000 | 0008 | 2050 | 8000 | 002c |
| 1737460 | ffff | fb05 | 0008 | 2105 | 8000 | 0000 | 0000 | 0000 | 0008 | 21dd | 8000 | 0000 | 0000 | 0000 | 0008 | 2264 | 2000 | 0008 | 0000 | 0000 | 0008 | 2289 | 8000 | 000c |
| 1737540 | ffff | fb05 | 0008 | 2317 | 8000 | 0000 | 0000 | 0000 | 0008 | 23e6 | 8000 | 0000 | 0000 | 0000 | 0008 | 2404 | 8000 | 0030 | ffff | fb05 | 0008 | 2508 | 8000 | 0030 |
| 1737620 | ffff | fb05 | 0008 | 253e | 8000 | 0000 | 0000 | 0000 | 0008 | 25ff | 8000 | 0000 | 0000 | 0000 | 0008 | 2603 | 2000 | 0008 | 0000 | 0000 | 0008 | 2623 | 2000 | 0001 |
| 1737700 | 0000 | 0000 | 0008 | 2632 | 2000 | 000c | 0000 | 0000 | 0008 | 2647 | 2400 | 0001 | 0002 | b114 | 0008 | 2660 | a000 | 0030 | 0000 | 0044 | 0008 | 267a | 8400 | 0000 |
| 1737760 | 0002 | b114 | 0000 | 0000 | 4400 | 0018 | 0002 | b114 | 0000 | 0000 | 4400 | 0018 | 0002 | b124 | 0008 | 2683 | 8000 | 0000 | 0000 | 0000 | 0000 | 0000 | 4400 | 0019 |
| 1740040 | 0002 | b124 | 0000 | 0000 | 4400 | 001a | 0002 | b130 | 0000 | 0000 | 4400 | 001b | 0002 | b13c | 0008 | 2690 | 8000 | 0000 | 0000 | 0000 | 0008 | 26a7 | 2400 | 0001 |
| 1740120 | 0002 | b14c | 0008 | 26ce | a000 | 0030 | 0000 | 0044 | 0008 | 26df | a000 | 0008 | 0000 | 0048 | 0000 | 0000 | 4400 | 001f | 0002 | b14c | 0008 | 26ec | 4000 | 0030 |
| 1740200 | 0000 | 0018 | 0000 | 0000 | 4400 | 001f | 0002 | b15c | 0008 | 26fd | 8000 | 008c | ffff | fffc | 0008 | 2713 | 8000 | 001c | ffff | fff8 | 0008 | 272a | 8000 | 003c |
| 1740260 | ffff | fff4 | 0008 | 273b | 8000 | 0001 | ffff | fff0 | 0008 | 274d | 8000 | 000c | ffff | ffec | 0008 | 2766 | 8000 | 000c | ffff | ffe8 | 0008 | 2777 | 8000 | 0004 |
| 1740340 | ffff | ffe4 | 0000 | 0000 | c000 | 0002 | 0000 | 02fc | 0008 | 278e | 8000 | 0000 | 0000 | 0000 | 0000 | 0000 | 4400 | 003b | 0002 | b15c | 0008 | 279b | 8000 | 0000 |
| 1740420 | 0000 | 0000 | 0000 | 0000 | 4400 | 003c | 0002 | b15c | 0008 | 27a5 | 8000 | 0000 | 0000 | 0000 | 0000 | 0000 | 4400 | 003d | 0002 | b15c | 0008 | 27af | 8000 | 0000 |
| 1740500 | 0000 | 0000 | 0000 | 0000 | 4400 | 003e | 0002 | b15c | 0008 | 27bb | 8000 | 0000 | 0000 | 0000 | 0000 | 0000 | 4400 | 003f | 0002 | b15c | 0008 | 27ca | 8000 | 0000 |
| 1740560 | 0000 | 0000 | 0000 | 0000 | 4400 | 0040 | 0002 | b15c | 0008 | 27da | 8000 | 0000 | 0000 | 0000 | 0000 | 0000 | 4400 | 0041 | 0002 | b15c | 0008 | 27e8 | 8000 | 0000 |
| 1740640 | 0000 | 0000 | 0000 | 0000 | 4400 | 0042 | 0002 | b15c | 0000 | 0000 | 4400 | 0020 | 0002 | b15c | 0000 | 0000 | 4400 | 0025 | 0002 | b164 | 0000 | 0000 | 4400 | 0027 |
| 1740720 | 0002 | b184 | 0000 | 0000 | 4400 | 0029 | 0002 | b1c8 | 0000 | 0000 | 4400 | 0029 | 0002 | b1e8 | 0000 | 0000 | 4400 | 002a | 0002 | b228 | 0000 | 0000 | 4400 | 002b |
| 1741000 | 0002 | b23c | 0000 | 0000 | 4400 | 002e | 0002 | b25c | 0000 | 0000 | 4400 | 002f | 0002 | b26c | 0000 | 0000 | 4400 | 0030 | 0002 | b28c | 0000 | 0000 | 4400 | 0031 |
| 1741060 | 0002 | b2ac | 0000 | 0000 | 4400 | 0034 | 0002 | b2bc | 0000 | 0000 | 4400 | 0035 | 0002 | b2dc | 0000 | 0000 | 4400 | 0036 | 0002 | b2fc | 0000 | 0000 | e000 | 0002 |
| 1741140 | 0000 | 04ac | 0000 | 0000 | 4400 | 0038 | 0002 | b30c | 0008 | 27f6 | 8000 | 0000 | 0000 | 0000 | 0008 | 281b | 2400 | 0001 | 0002 | b31c | 0008 | 2847 | a000 | 0030 |
| 1741220 | 0000 | 0044 | 0008 | 2858 | a000 | 0001 | 0000 | 0048 | 0000 | 0000 | 4400 | 003d | 0002 | b31c | 0008 | 2868 | 4000 | 0030 | 0000 | 0018 | 0000 | 0000 | 4400 | 003d |
| 1741300 | 0002 | b32c | 0008 | 2879 | 8000 | 0000 | 0000 | 0000 | 0008 | 2886 | 8000 | 0000 | 0000 | 0000 | 0000 | 0000 | 4400 | 003e | 0002 | b32c | 0000 | 0000 | 4400 | 0042 |
| 1741360 | 0002 | b334 | 0000 | 0000 | 4400 | 0043 | 0002 | b378 | 0000 | 0000 | 4400 | 0044 | 0002 | b384 | 0008 | 2893 | 8000 | 0000 | 0000 | 0000 | 0008 | 28bc | 2400 | 0001 |
| 1741440 | 0002 | b394 | 0008 | 28dd | 8400 | 0000 | 0002 | b394 | 0000 | 0000 | 4400 | 023b | 0002 | b394 | 0000 | 0000 | 4400 | 023b | 0002 | b3a0 | 0000 | 0000 | 4400 | 023c |
| 1741520 | 0002 | b3b0 | 0008 | 29fa | 2400 | 0001 | 0002 | b3c0 | 0000 | 0000 | 4400 | 023b | 0002 | b3c0 | 0000 | 0000 | 4400 | 023b | 0002 | b3cc | 0000 | 0000 | 4400 | 023c |
| 1741600 | 0002 | b3e0 | 0008 | 291b | 2000 | 0008 | 0000 | 0000 | 0008 | 2945 | 2000 | 0008 | 0000 | 0000 | 0008 | 2987 | 2000 | 0008 | 0000 | 0000 | 0008 | 29bf | 2400 | 0001 |
| 1741660 | 0002 | b3f0 | 0008 | 29dd | a000 | 0030 | 0000 | 0044 | 0008 | 29ee | a000 | 0001 | 0000 | 0048 | 0008 | 29fb | 8400 | 0000 | 0002 | b3f0 | 0000 | 0000 | 4400 | 000b |
| 1741740 | 0002 | b3f0 | 0000 | 0000 | 4400 | 000b | 0002 | b404 | 0008 | 2a0a | 8000 | 0000 | 0000 | 0000 | 0008 | 2a17 | 8000 | 0000 | 0000 | 0000 | 0000 | 0000 | 4400 | 000c |
| 1742020 | 0002 | b404 | 0000 | 0000 | 4400 | 000a | 0002 | b404 | 0000 | 0000 | 4400 | 000b | 0002 | b418 | 0000 | 0000 | 4400 | 000a | 0002 | b444 | 0008 | 2a21 | 8000 | 0000 |
| 1742100 | 0000 | 0000 | 0008 | 2a3d | 2400 | 0001 | 0002 | b454 | 0008 | 2a62 | a000 | 0018 | 0000 | 0044 | 0008 | 2a7c | a000 | 0001 | 0000 | 0048 | 0008 | 2a89 | 8400 | 0000 |
| 1742160 | 0002 | b454 | 0000 | 0000 | 4400 | 0009 | 0002 | b454 | 0008 | 2abd | 4000 | 0018 | 0000 | 0018 | 0000 | 0000 | 4400 | 0009 | 0002 | b464 | 0008 | 2ace | 8000 | 0000 |
| 1742240 | 0000 | 0000 | 0008 | 2adb | 6000 | 0000 | 0000 | 0000 | 0000 | 0000 | 4400 | 000a | 0002 | b464 | 0000 | 0000 | 4400 | 0008 | 0002 | b464 | 0000 | 0000 | 4400 | 0009 |
| 1742320 | 0002 | b474 | 0000 | 0000 | 4400 | 000a | 0002 | b484 | 0008 | 2ae5 | 8000 | 0000 | 0000 | 0000 | 0008 | 2b08 | 2400 | 0001 | 0002 | b494 | 0008 | 2b2e | a000 | 001c |
| 1742400 | 0000 | 0044 | 0008 | 2b3f | a000 | 0001 | 0000 | 0048 | 0008 | 2b4c | 8400 | 0000 | 0002 | b494 | 0000 | 0000 | 4400 | 001c | 0002 | b494 | 0008 | 2b83 | 4000 | 001c |
| 1742460 | 0000 | 0018 | 0000 | 0000 | 4400 | 001c | 0002 | b4a4 | 0008 | 2b94 | 8000 | 0000 | 0000 | 0000 | 0008 | 2ba1 | 8000 | 0000 | 0000 | 0000 | 0000 | 0000 | 4400 | 001d |
| 1742540 | 0002 | b4a4 | 0000 | 0000 | 4400 | 001c | 0002 | b4a4 | 0000 | 0000 | 4400 | 001d | 0002 | b4e8 | 0008 | 2bab | 8000 | 0000 | 0000 | 0000 | 0008 | 2bcf | 2400 | 0001 |
| 1742620 | 0002 | b4f8 | 0008 | 2bfe | a000 | 003c | 0000 | 0044 | 0008 | 2c0e | a000 | 0001 | 0000 | 0048 | 0008 | 2c1b | 8400 | 0000 | 0002 | b4f8 | 0000 | 0000 | 4400 | 002e |
| 1742700 | 0002 | b4f8 | 0008 | 2c52 | 4000 | 003c | 0000 | 0018 | 0000 | 0000 | 4400 | 002e | 0002 | b508 | 0008 | 2c62 | 8000 | 0000 | 0000 | 0000 | 0008 | 2c6f | 8000 | 0000 |
| 1742760 | 0000 | 0000 | 0000 | 0000 | 4400 | 002f | 0002 | b508 | 0000 | 0000 | 4400 | 002d | 0002 | b508 | 0008 | 2c79 | 8000 | 0000 | 0000 | 0000 | 0008 | 2ca6 | 2400 | 0001 |

```
1743040 0002 b52c 0008 2cc3 a000 000c 0000 0044 0008 2cdc a000 0001 0000 0048 0008 2ce9 8400 0000 0002 b52c 0000 0000 4400 0012
1743120 0002 b52c 0008 2d1d 4000 000c 0000 0018 0000 0000 4400 0012 0002 b53c 0008 2d2e 8000 0000 0000 0000 0008 2d3b 8000 0000
1743200 0000 0000 0000 0000 4400 0013 0002 b53c 0000 0000 4400 0011 0002 b53c 0000 0000 4400 0012 0002 b560 0000 0000 4400 0013
1743260 0002 b594 0008 2d45 8000 0000 0000 0000 0008 2d60 2400 0004 0002 b5a4 0008 2d80 a000 0008 0000 0044 0008 2d90 a000 0004
1743340 0000 0048 0008 2daa 8400 0000 0002 b5a4 0000 0000 4400 001b 0002 b5a4 0000 0000 4400 001b 0002 b5b8 0008 2ddd 8000 0000
1743420 0000 0000 0008 2dea 8000 0000 0000 0000 0000 0000 4400 001c 0002 b5b8 0000 0000 4400 001a 0002 b5b8 0008 2df8 8000 0000
1743500 0000 0000 0008 2e16 2400 0004 0002 b5d4 0008 2e36 a000 0008 0000 0044 0008 2e46 a000 0004 0000 0048 0000 0000 4400 001a
1743560 0002 b5e8 0008 2e58 8000 0000 0000 0000 0008 2e65 8000 0000 0000 0000 0000 0000 4400 001b 0002 b5e8 0000 0000 4400 0019
1743640 0002 b5e8 0008 2e73 8000 0000 0000 0000 0008 2e91 2400 0001 0002 b604 0008 2eae a000 0008 0000 0044 0008 2ebe a000 0001
1743720 0000 0048 0008 2ecf a000 0008 0000 004c 0000 0000 4400 0019 0002 b620 0008 2ee0 8000 0000 0000 0000 0008 2eed 8000 0000
1744000 0000 0000 0000 0000 4400 001a 0002 b620 0008 2efb 8000 0000 0000 0000 0000 0000 4400 001b 0002 b620 0000 0000 4400 0018
1744060 0002 b620 0008 2f09 8000 0000 0000 0000 0008 2f24 2400 0001 0002 b630 0008 2f41 a000 0008 0000 0044 0008 2f51 a000 0001
1744140 0000 0048 0008 2f62 a000 0004 0000 004c 0000 0000 4400 0019 0002 b648 0008 2f72 8000 0000 0000 0000 0008 2f7f 8000 0000
1744220 0000 0000 0000 0000 4400 0019 0002 b648 0008 2f8d 8000 0000 0000 0000 0000 0000 4400 001a 0002 b648 0000 0000 4400 0017
1744300 0002 b648 0008 2f9b 8000 0000 0000 0000 0008 2fb6 2400 0001 0002 b658 0008 2fd4 a000 0008 0000 0044 0008 2fe4 a000 0001
1744360 0000 0048 0008 2ff5 a000 0001 0000 004c 0000 0000 4400 0017 0002 b670 0008 3006 8000 0000 0000 0000 0008 3013 8000 0000
1744440 0000 0000 0000 0000 4400 0018 0002 b670 0008 3021 8000 0000 0000 0000 0000 0000 4400 0019 0002 b670 0000 0000 4400 0016
1744520 0002 b670 0008 302f 8000 0000 0000 0000 0008 304b 2400 0001 0002 b680 0008 3069 a000 0008 0000 0044 0008 3079 a000 0001
1744600 0000 0048 0008 308a a000 0004 0000 004c 0000 0000 4400 0016 0002 b698 0008 309a 8000 0000 0000 0000 0008 30a7 8000 0000
1744660 0000 0000 0000 0000 4400 0017 0002 b698 0008 30b5 8000 0000 0000 0000 0000 0000 4400 0018 0002 b698 0000 0000 4400 0015
1744740 0002 b698 0008 30c3 8000 0000 0000 0000 0008 30de 2400 0001 0002 b6b4 0008 30fa a000 0008 0000 0044 0008 310a a000 0004
1745020 0000 0048 0000 0000 4400 0015 0002 b6c8 0008 311a 8000 0000 0000 0000 0008 3127 8000 0000 0000 0000 0000 0000 4400 0016
1745100 0002 b6c8 0000 0000 4400 0014 0002 b6c8 0008 3135 8000 0000 0000 0000 0008 314e 2400 0004 0002 b6e4 0008 316f a000 0004
1745160 0000 0044 0008 3180 a000 0004 0000 0048 0008 3192 8400 0000 0002 b6e4 0000 0000 4400 0015 0002 b6e4 0000 0000 4400 0015
1745240 0002 b6f8 0008 31c4 8000 0000 0000 0000 0008 31d1 8000 0000 0000 0000 0000 0000 4400 0016 0002 b6f8 0000 0000 4400 0014
1745320 0002 b6f8 0008 31df 8000 0000 0000 0000 0008 31fe 0400 0000 0002 b718 0008 320c 0400 0000 0002 b718 0008 321d 0800 0000
1745400 0004 af10 0008 322c 6400 0000 0002 b718 0008 325f 6400 0000 0002 b718 0008 326d 8400 0000 0002 b718 0008 327d 8000 0000
1745460 0000 0000 0008 32a7 8000 0000 0000 0000 0008 32c1 8000 0000 0000 0000 0008 32ec 8000 0000 0000 0000 0008 330e 8000 0000
1745540 0000 0000 0008 3331 8000 0000 0000 0000 0008 3357 8000 0000 0000 0000 0008 3379 8000 0000 0000 0000 0008 339a 8000 0000
1745620 0000 0000 0008 33b3 8000 0000 0000 0000 0008 33ce 8000 0000 0000 0000 0008 33e2 8000 0000 0000 0000 0008 33f4 8000 0004
1745700 ffff fb05 0008 3412 8000 0008 ffff fb05 0008 344f 8000 0001 ffff fb05 0008 346c 8000 0004 ffff fb05 0008 347a 2000 0004
1745760 0000 0000 0008 3487 2000 0004 0000 0000 0008 3497 2000 0001 0000 0000 0008 34b6 2000 0004 0000 0000 0008 34c1 2000 0004
1746040 0000 0000 0008 34ce 2000 0004 0000 0000 0008 34db 2000 0001 0000 0000 0008 34ea 2000 0004 0000 0000 0008 34f8 2000 0004
1746120 0000 0000 0008 3506 8000 0004 ffff fb05 0008 3517 8000 0004 ffff fb05 0008 3525 8000 0004 ffff fb05 0008 3536 8000 0004
1746200 ffff fb05 0008 3547 8000 0004 ffff fb05 0008 35be 8000 0004 ffff fb05 0008 3656 8000 0004 ffff fb05 0008 369a 8000 0004
1746260 ffff fb05 0008 371a 8000 0004 ffff fb05 0008 3794 8000 0004 ffff fb05 0008 37c2 8000 003c ffff fb05 0008 38d9 8000 003c
1746340 ffff fb05 0008 39d5 2000 0004 0000 0000 0008 39ec 2000 0004 0000 0000 0008 3a05 2000 0004 0000 0000 0008 3a1d 2000 0004
1746420 0000 0000 0008 3a32 2000 0004 0000 0000 0008 3a48 2000 0001 0000 0000 0008 3a61 8000 0000 0000 0000 0008 3b27 8000 0000
1746500 0000 0000 0008 3bed 8000 0000 0000 0000 0008 3cad 8000 0000 0000 0000 0008 3d01 8000 0028 ffff fb05 0008 3e1b 8000 0028
1746560 ffff fb05 0008 3e80 8000 0000 0000 0000 0008 3f4b 8000 0000 0000 0000 0008 4016 8000 0000 0000 0000 0008 40d4 8000 0000
1746640 0000 0000 0008 4198 8000 0000 0000 0000 0008 4254 8000 0000 0000 0000 0008 42bc 8000 0048 ffff fb05 0008 433a 8000 0000
1746720 0000 0000 0008 43fe 8000 0000 0000 0000 0008 44c8 8000 0000 0000 0000 0008 459d 8000 0000 0000 0000 0008 4669 8000 0000
1747000 0000 0000 0008 4707 8000 0044 ffff fb05 0008 475e 8000 0000 0000 0000 0008 4824 8000 0000 0000 0000 0008 48ef 8000 0000
1747060 0000 0000 0008 49bc 8000 0000 0000 0000 0008 49fe 2400 0044 0002 b718 0008 4a1e a000 0044 0000 0044 0008 4a2e a000 0001
1747140 0000 0048 0008 4a3a 8400 0000 0002 b718 0000 0000 4400 01d1 0002 b718 0008 4a57 4000 0044 0000 0018 0000 0000 4400 01d1
1747220 0002 b728 0008 4a67 8000 0000 0000 0000 0008 4a74 8000 0000 0000 0000 0000 0000 4400 01d2 0002 b728 0000 0000 4400 01d3
1747300 0002 b75c 0000 0000 4400 01d4 0002 b80c 0000 0000 4400 01d6 0002 b830 0000 0000 4400 01d8 0002 b860 0000 0000 4400 01d9
1747360 0002 b86c 0008 4a7e 8000 0000 0000 0000 0008 4a93 8000 0050 ffff fb05 0008 4b0e 8000 0000 0000 0000 0008 4b95 2000 0000
1747440 0000 0000 0008 4bb7 2000 0000 0000 0000 0008 4bda 2000 0000 0000 0000 0008 4be7 2000 0000 0000 0000 0008 4bf4 8000 0001
1747520 ffff fb05 0008 4c2e 2000 0004 0000 0000 0008 4c50 2000 0004 0000 0000 0008 4c72 8000 0000 0000 0000 0008 4cff 2800 0001
1747600 0004 af10 0008 4d15 8000 0004 ffff fb05 0008 4d21 8000 0008 ffff fb05 0008 4d84 8000 0000 0000 0000 0008 4e00 8000 0004
1747660 ffff fb05 0008 4e35 8000 0000 0000 0000 0008 4e89 8000 0008 ffff fb05 0008 4ef4 8000 0000 0000 0000 0008 4f5a 8000 0004
1747740 ffff fb05 0008 4f8f 8000 0000 0000 0000 0008 4feb 8000 0008 ffff fb05 0008 504e 8000 0000 0000 0000 0008 50b4 8000 0004
1750020 ffff fb05 0008 50e9 8000 0000 0000 0000 0008 5145 8000 0008 ffff fb05 0008 51b3 8000 0000 0000 0000 0008 5240 8000 0004
1750100 ffff fb05 0008 5277 8000 0000 0000 0000 0008 52d9 8000 0008 ffff fb05 0008 532f 8000 0000 0000 0000 0008 53b0 8000 0004
```

```
1750160  ffff fb05 0008 53e7 8000 0000 0000 0000 0008 543f 800C 0008 ffff fb05 0008 5495 8000 0000 0000 0000 0008 54ff 8000 0004
1750240  ffff fb05 0008 5536 8000 0000 0000 0000 0008 5596 8000 0008 ffff fb05 0008 55ec 8000 0000 0000 0000 0008 5656 8000 0004
1750320  ffff fb05 0008 568d 8000 0000 0000 0000 0008 56ed 8000 0008 ffff fb05 0008 5746 8000 0000 0000 0000 0008 57d8 8000 0004
1750400  ffff fb05 0008 5811 8000 0000 0000 0000 0008 5877 8000 0034 ffff fb05 0008 5990 8000 0034 ffff fb05 0008 5a72 8000 0000
1750460  0000 0000 0008 5b3c 8000 0000 0000 0000 0008 5b69 8000 0040 ffff fb05 0008 5c81 8000 0040 ffff fb05 0008 5d9b 2000 0004
1750540  0000 0000 0008 5db5 8000 0000 0000 0000 0008 5e82 8000 0000 0000 0000 0008 5f2d 8000 0084 ffff fb05 0008 5fb2 8000 0000
1750620  0000 0000 0008 6087 8000 0000 0000 0000 0008 6103 8000 0004 ffff fb05 0008 6117 8000 0004 ffff fb05 0008 6153 8000 0004
1750700  ffff fb05 0008 6194 8000 0004 ffff fb05 0008 61d2 8000 0004 ffff fb05 0008 620d 8000 0004 ffff fb05 0008 624b 8000 0004
1750760  ffff fb05 0008 626d 8000 0004 ffff fb05 0008 628f 2000 0001 0000 0000 0008 629e 8000 000c ffff fb05 0008 632b 8000 0000
1751040  0000 0000 0008 63fa 8000 0000 0000 0000 0008 6418 8000 0044 ffff fb05 0008 647a 8000 0000 0000 0000 0008 6540 8000 0000
1751120  0000 0000 0008 656b 2400 0001 0002 b87c 0008 6598 a000 000c 0000 0044 0008 65b0 a000 0001 0000 0048 0008 65bd 8400 0000
1751200  0002 b87c 0000 0000 4400 0012 0002 b87c 0008 65cd 4000 000c 0000 0018 0000 0000 4400 0012 0002 b88c 0008 65dd 8000 0000
1751260  0000 0000 0008 65ea 8000 0000 0000 0000 0000 0000 4400 0013 0002 b88c 0000 0000 4400 0015 0002 b89c 0000 0000 4400 0016
1751340  0002 b8bc 0000 0000 4400 0017 0002 b8c0 0000 0000 4400 001a 0002 b8d0 0000 0000 4400 001b 0002 b9f0 0000 0000 4400 001c
1751420  0002 b9f8 0000 0000 4400 001f 0002 b908 0000 0000 4400 0020 0002 b928 0000 0000 4400 0021 0002 b930 0000 0000 4400 0024
1751500  0002 b940 0000 0000 4400 0025 0002 b960 0000 0000 4400 0026 0002 b968 0000 0000 4400 0028 0002 b970 0008 65f4 8000 0000
1751560  0000 0000 0008 661f 2400 0004 0002 b980 0008 6647 a000 000c 0000 0044 0000 0000 4400 002d 0002 b980 0008 6657 4000 000c
1751640  0000 0018 0000 0000 4400 002d 0002 b98c 0008 6667 8000 0000 0000 0000 0000 0000 4400 002e 0002 b98c 0000 0000 4400 002f
1751720  0002 b99c 0000 0000 4400 0031 0002 b9a8 0000 0000 4400 0032 0002 b9c8 0000 0000 4400 0033 0002 b9d4 0008 6674 8000 0000
1752000  0000 0000 0008 669a 2400 0004 0002 b9e4 0008 66c2 a000 000c 0000 0044 0000 0000 4400 003a 0002 b9e4 0008 66d2 4000 000c
1752060  0000 0018 0000 0000 4400 003a 0002 b9f0 0008 66e2 8000 0000 0000 0000 0000 0000 4400 003c 0002 b9f0 0000 0000 4400 003d
1752140  0002 ba00 0000 0000 4400 0040 0002 ba0c 0000 0000 4400 0041 0002 ba2c 0000 0000 4400 0042 0002 ba38 0008 66ef 8000 0000
1752220  0000 0000 0008 6715 2400 0001 0002 ba48 0008 6748 8400 0000 0002 ba48 0000 0000 4400 023b 0002 ba48 0000 0000 4400 023b
1752300  0002 ba54 0000 0000 4400 023c 0002 ba64 0008 6765 2400 0001 0002 ba74 0000 0000 4400 023b 0002 ba74 0000 0000 4400 023b
1752360  0002 ba80 0000 0000 4400 023c 0002 ba94 0008 6798 0400 0000 0002 baa8 0008 67a1 0400 0000 0002 c0b8 0008 67c8 0400 0000
1752440  0002 baa8 0008 67d9 0400 0000 0002 c0e8 0008 67fc 0400 0000 0002 c130 0008 6811 0400 0000 0002 bc40 0008 6828 0800 0000
1752520  0004 af18 0008 6837 0400 0000 0002 c150 0008 684e 0400 0000 0002 c10c 0008 6868 0400 0000 0002 c1c8 0008 6883 6400 0000
1752600  0002 baa8 0008 68b6 6400 0000 0002 baa8 0008 68bf 8400 0000 0002 baa8 0008 68ca 8000 0000 0000 0000 0008 68f4 8000 0000
1752660  0000 0000 0008 690e 8000 0000 0000 0000 0008 6939 8000 0000 0000 0000 0008 695b 8000 0000 0000 0000 0008 697e 8000 0000
1752740  0000 0000 0008 69a4 8000 0000 0000 0000 0008 69c6 8000 0000 0000 0000 0008 69e7 8000 0000 0000 0000 0008 6a00 8000 0000
1753020  0000 0000 0008 6a1b 8000 0000 0000 0000 0008 6a2f 8000 0000 0000 0000 0008 6a41 8000 0004 ffff fb05 0008 6a5f 8000 0008
1753100  ffff fb05 0008 6a9c 8000 0001 ffff fb05 0008 6ab9 8000 0004 ffff fb05 0008 6ac7 2000 0004 0000 0000 0008 6ad4 2000 0004
1753160  0000 0000 0008 6ae4 2000 0001 0000 0000 0008 6b03 2000 0004 0000 0000 0008 6b0e 2000 0004 0000 0000 0008 6b1b 2000 0004
1753240  0000 0000 0008 6b28 2000 0001 0000 0000 0008 6b37 2000 0004 0000 0000 0008 6b45 2000 0004 0000 0000 0008 6b53 8000 0004
1753320  ffff fb05 0008 6b64 8000 0004 ffff fb05 0008 6b72 8000 0004 ffff fb05 0008 6b83 8000 0004 ffff fb05 0008 6b94 8000 0004
1753400  ffff fb05 0008 6c0b 8000 0004 ffff fb05 0008 6ca3 8000 0004 ffff fb05 0008 6ce7 8000 0004 ffff fb05 0008 6d67 8000 0004
1753460  ffff fb05 0008 6de1 8000 0004 ffff fb05 0008 6e0f 8000 003c ffff fb05 0008 6f26 8000 003c ffff fb05 0008 7022 2000 0004
1753540  0000 0000 0008 7039 2000 0004 0000 0000 0008 7052 2000 0004 0000 0000 0008 706a 2000 0004 0000 0000 0008 707f 2000 0004
1753620  0000 0000 0008 7095 2000 0001 0000 0000 0008 70ae 8000 0000 0000 0000 0008 7174 8000 0000 0000 0000 0008 723a 8000 0000
1753700  0000 0000 0008 72fa 8000 0000 0000 0000 0008 734e 8000 0028 ffff fb05 0008 7468 8000 0028 ffff fb05 0008 74cd 8000 0000
1753760  0000 0000 0008 7598 8000 0000 0000 0000 0008 7663 8000 0000 0000 0000 0008 7721 8000 0000 0000 0000 0008 77e5 8000 0000
1754040  0000 0000 0008 78aa 8000 0000 0000 0000 0008 7909 8000 0048 ffff fb05 0008 7987 8000 0000 0000 0000 0008 7a4b 8000 0000
1754120  0000 0000 0008 7b15 8000 0000 0000 0000 0008 7bea 8000 0000 0000 0000 0008 7cb6 8000 0000 0000 0000 0008 7d54 8000 0044
1754200  ffff fb05 0008 73ab 8000 0000 0000 0000 0008 7e71 8000 0000 0000 0000 0008 7f3c 8000 0000 0000 0000 0008 8009 8000 0000
1754260  0000 0000 0008 804b 2400 0044 0002 baa8 0008 806b a000 0044 0000 0044 0008 807b a000 0001 0000 0048 0008 8087 8400 0000
1754340  0002 baa8 0000 0000 4400 01d1 0002 baa8 0008 80a4 4000 0044 0000 0018 0000 0000 4400 01d1 0002 bab8 0008 80b4 8000 0000
1754420  0000 0000 0008 80c1 8000 0000 0000 0000 0000 0000 4400 01d2 0002 bab8 0000 0000 4400 01d3 0002 baec 0000 0000 4400 01d4
1754500  0002 bb90 0000 0000 4400 01d6 0002 bbc0 0000 0000 4400 01d8 0002 bbf0 0000 0000 4400 01d9 0002 bbfc 0008 80cb 8000 0000
1754560  0000 0000 0008 80e0 8000 0050 ffff fb05 0008 815b 8000 0000 0000 0000 0008 81e2 2000 0000 0000 0000 0008 8204 2000 0000
1754640  0000 0000 0008 8227 2000 0000 0000 0000 0008 8234 2000 0000 0000 0000 0008 8241 8000 0001 ffff fb05 0008 827b 2000 0004
1754720  0000 0000 0008 829d 2000 0004 0000 0000 0008 82bf 8000 0000 0000 0000 0008 834c 2800 0001 0004 af18 0008 8362 8000 0004
1755000  ffff fb05 0008 836e 8000 0008 ffff fb05 0008 83d1 8000 0000 0000 0000 0008 844d 8000 0004 ffff fb05 0008 8482 8000 0000
1755060  0000 0000 0008 84d6 8000 0008 ffff fb05 0008 8541 8000 0000 0000 0000 0008 85a7 8000 0004 ffff fb05 0008 85dc 8000 0000
1755140  0000 0000 0008 8638 8000 0008 ffff fb05 0008 869b 8000 0000 0000 0000 0008 8701 8000 0004 ffff fb05 0008 8736 8000 0000
1755220  0000 0000 0008 8792 8000 0008 ffff fb05 0008 8900 8000 0000 0000 0000 0008 888d 8000 0004 ffff fb05 0008 88c4 8000 0000
```

```
1755300  0000 0000 0008 8926 8000 0008 ffff fb05 0008 897c 8000 0000 0000 0000 0008 89fd 8000 0004 ffff fb05 0008 8a34 8000 0000
1755360  0000 0000 0008 8a8c 8000 0008 ffff fb05 0008 8ae2 8000 0000 0000 0000 0008 8b4c 8000 0004 ffff fb05 0008 8b83 8000 0000
1755440  0000 0000 0008 8be3 8000 0008 ffff fb05 0008 8c39 8000 0000 0000 0000 0008 8ca3 8000 0004 ffff fb05 0008 8cda 8000 0000
1755520  0000 0000 0008 8d3a 8000 0008 ffff fb05 0008 8d93 8000 0000 0000 0000 0008 8e25 8000 0004 ffff fb05 0008 8e5e 8000 0000
1755600  0000 0000 0008 8ec4 8000 0034 ffff fb05 0008 8fdd 8000 0034 ffff fb05 0008 90bf 8000 0000 0000 0000 0008 9189 8000 0000
1755660  0000 0000 0008 91b6 8000 0040 ffff fb05 0008 92ce 8000 0040 ffff fb05 0008 93e8 2000 0004 0000 0000 0008 9402 8000 0000
1755740  0000 0000 0008 94cf 8000 0000 0000 0000 0008 957a 8000 0084 ffff fb05 0008 95ff 8000 0000 0000 0000 0008 96d4 8000 0000
1756020  0000 0000 0008 9750 8000 0004 ffff fb05 0008 9764 8000 0004 ffff fb05 0008 97a0 8000 0004 ffff fb05 0008 97e1 8000 0004
1756100  ffff fb05 0008 981f 8000 0004 ffff fb05 0008 985a 8000 0004 ffff fb05 0008 9898 8000 0004 ffff fb05 0008 98ba 8000 0004
1756160  ffff fb05 0008 98dc 2000 0001 0000 0000 0008 98eb 8000 0004 ffff fb05 0008 991a 8000 0000 0000 0000 0008 999f 2000 0008
1756240  0000 0000 0008 99c3 8000 0008 ffff fb05 0008 99ce 8000 0008 ffff fb05 0008 99da 8000 0008 ffff fb05 0008 99e6 8000 0008
1756320  ffff fb05 0008 9a32 8000 0000 0000 0000 0008 9af8 8000 0000 0000 0000 0008 9b5a 8000 0044 ffff fb05 0008 9bbc 8000 0000
1756400  0000 0000 0008 9c82 8000 0000 0000 0000 0008 9cad 8000 0008 ffff fb05 0008 9cb9 8000 000c ffff fb05 0008 9d2c 8000 0000
1756460  0000 0000 0008 9db8 8000 0008 ffff fb05 0008 9e0c 8000 0000 0000 0000 0008 9e8c 8000 000c ffff fb05 0008 9f02 8000 0000
1756540  0000 0000 0008 9fad 2000 0008 0000 0000 0008 9fd3 8000 000c ffff fb05 0008 a037 8000 0000 0000 0000 0008 a0f8 8000 0000
1756620  0000 0000 0008 a168 2000 0008 0000 0000 0008 a18a 8000 000c ffff fb05 0008 a1ef 8000 0000 0000 0000 0008 a2bd 8000 0000
1756700  0000 0000 0008 a32b 2000 0008 0000 0000 0008 a34e 8000 0008 ffff fb05 0008 a3af 8000 0000 0000 0000 0008 a456 8000 0010
1756760  ffff fb05 0008 a4e6 8000 0000 0000 0000 0008 a597 8000 0018 ffff fb05 0008 a627 8000 0000 0000 0000 0008 a6f7 8000 0000
1757040  0000 0000 0008 a77f 2000 0008 0000 0000 0008 a7a3 2000 0001 0000 0000 0008 a7b2 8400 0000 0002 bc0c 0008 a7bd 2400 0001
1757120  0002 bc0c 0008 a7d7 a000 0018 0000 0044 0000 0000 4400 0013 0002 bc0c 0008 a7ef 4000 0018 0000 0018 0000 0000 4400 0013
1757200  0002 bc18 0008 a7ff 8000 0000 0000 0000 0000 0000 4400 0014 0002 bc18 0000 0000 4400 0015 0002 bc30 0008 a80c 8000 0000
1757260  0000 0000 0008 a824 2400 0010 0002 bc40 0008 a84a a000 0010 0000 0044 0008 a85a a000 0001 0000 0048 0008 a867 a000 0001
1757340  0000 004c 0008 a874 8400 0000 0002 bc40 0000 0000 4400 000a 0002 bc40 0008 a885 4000 0010 0000 0018 0000 0000 4400 000a
1757420  0002 bc54 0008 a895 8000 0000 0000 0000 0008 a8a2 8000 0000 0000 0000 0000 0000 4400 000b 0002 bc54 0008 a8ac 8000 0000
1757500  0000 0000 0000 0000 4400 000c 0002 bc54 0000 0000 4400 0007 0002 bc54 0000 0000 4400 0008 0002 bc90 0000 0000 4400 0009
1757560  0002 bcbc 0000 0000 4400 000e 0002 bcc4 0000 0000 4400 000f 0002 bcd0 0008 a8b6 8000 0000 0000 0000 0008 a8d1 2400 0001
1757640  0002 bce0 0008 a8f4 a000 0018 0000 0044 0008 a904 a000 0001 0000 0048 0008 a911 a000 0001 0000 004c 0008 a91e 8400 0000
1757720  0002 bce0 0000 0000 4400 0019 0002 bce0 0008 a929 4000 0018 0000 0018 0000 0000 4400 0019 0002 bcf4 0008 a939 8000 0008
1760000  ffff fffc 0008 a948 8000 000c ffff fff8 0008 a960 8000 000c ffff fff4 0008 a97a 8000 0008 ffff fff0 0008 a991 8000 0008
1760060  ffff ffec 0008 a9ab 8000 0008 ffff ffe8 0000 0000 c000 0002 0000 024c 0008 a9c2 8000 0000 0000 0000 0000 0000 4400 001d
1760140  0002 bcf4 0008 a9cf 8000 0000 0000 0000 0000 0000 4400 001e 0002 bcf4 0008 a9d9 8000 0000 0000 0000 0000 0000 4400 001f
1760220  0002 bcf4 0008 a9e3 8000 0000 0000 0000 0000 0000 4400 0020 0002 bcf4 0008 a9f0 8000 0000 0000 0000 0000 0000 4400 0021
1760300  0002 bcf4 0008 a9fe 8000 0000 0000 0000 0000 0000 4400 0022 0002 bcf4 0008 aa16 8000 0000 0000 0000 0000 0000 4400 0023
1760360  0002 bcf4 0008 aa2b 8000 0000 0000 0000 0000 0000 4400 0024 0002 bcf4 0008 aa43 8000 0000 0000 0000 0000 0000 4400 0025
1760440  0002 bcf4 0000 0000 4400 001d 0002 bcf4 0000 0000 4400 001e 0002 bd08 0000 0000 4400 001f 0002 bd18 0000 0000 4400 0021
1760520  0002 bd3c 0000 0000 4400 0022 0002 be58 0000 0000 e000 0002 0000 03c0 0000 0000 4400 0024 0002 be68 0008 aa58 8000 0000
1760600  0000 0000 0008 aa79 2400 0004 0002 be78 0008 aa9a a000 0018 0000 0044 0008 aaaa a000 0001 0000 0048 0000 0000 4400 0028
1760660  0002 be78 0008 aab7 4000 0018 0000 0018 0000 0000 4400 0028 0002 be88 0008 aac7 8000 0010 ffff fffc 0008 aad4 8000 0008
1760740  ffff fff8 0008 aae3 8000 0004 ffff fff4 0000 0000 c000 0002 0000 03e0 0008 aaf3 8000 0000 0000 0000 0000 0000 4400 002c
1761020  0002 be88 0008 ab00 8000 0000 0000 0000 0000 0000 4400 002d 0002 be88 0008 ab0a 8000 0000 0000 0000 0000 0000 4400 002e
1761100  0002 be88 0008 ab15 8000 0000 0000 0000 0000 0000 4400 002f 0002 be88 0008 ab22 8000 0000 0000 0000 0000 0000 4400 0030
1761160  0002 be88 0000 0000 4400 002d 0002 be98 0000 0000 4400 002e 0002 be9c 0000 0000 4400 002f 0002 beac 0000 0000 4400 0030
1761240  0002 bec8 0000 0000 4400 0033 0002 bed4 0000 0000 4400 0034 0002 bedc 0000 0000 4400 0035 0002 bef4 0000 0000 4400 0037
1761320  0002 bf08 0000 0000 e000 0002 0000 046c 0000 0000 4400 0038 0002 bf14 0008 ab31 8000 0000 0000 0000 0008 ab50 2400 0004
1761400  0002 bf24 0008 ab75 a000 0010 0000 0044 0008 ab85 a000 0004 0000 0048 0000 0000 4400 003c 0002 bf24 0008 ab91 4000 0010
1761460  0000 0018 0000 0000 4400 003c 0002 bf34 0008 aba1 8000 0000 0000 0000 0008 abae 8000 0000 0000 0000 0000 0000 4400 003d
1761540  0002 bf34 0000 0000 4400 003e 0002 bf4c 0000 0000 4400 0040 0002 bf58 0000 0000 4400 0041 0002 bf78 0000 0000 4400 0043
1761620  0002 bf84 0000 0000 4400 0044 0002 bfa4 0000 0000 4400 0046 0002 bfb4 0000 0000 4400 0047 0002 bff4 0000 0000 4400 004a
1761700  0002 c00c 0000 0000 4400 004b 0002 c028 0000 0000 4400 004d 0002 c02c 0000 0000 4400 004e 0002 c038 0008 abb8 8000 0000
1761760  0000 0000 0008 abdb 2400 0001 0002 c048 0008 abfc 8400 0000 0002 c048 0000 0000 4400 023b 0002 c048 0000 0000 4400 023b
1762040  0002 c054 0008 ac19 8400 0000 0002 c064 0000 0000 4400 0010 0002 c064 0000 0000 4400 0011 0002 c078 0008 ac24 2400 0001
1762120  0002 c088 0008 ac45 8400 0000 0002 c088 0000 0000 4400 023b 0002 c088 0000 0000 4400 023b 0002 c094 0000 0000 4400 023c
1762200  0002 c0a8 0008 ac62 2000 0008 0000 0000 0008 ac8d 2000 0008 0000 0000 0008 acc6 2400 0001 0002 c0b8 0008 acf4 a000 0018
1762260  0000 0044 0008 ad04 a000 0001 0000 0048 0008 ad15 8400 0000 0002 c0b8 0000 0000 4400 001f 0002 c0b8 0000 0000 4400 001f
1762340  0002 c0cc 0008 ad26 8000 0000 0000 0000 0008 ad33 8000 0000 0000 0000 0000 0000 4400 0020 0002 c0cc 0000 0000 4400 001e
```

```
1762420  0002 c0cc 0008 ad41 8000 0000 0000 0000 0008 a16c 2400 0001 0002 c0e8 0008 ad95 a000 0018 0000 0044 0008 ada5 a000 0008
1762500  0000 0048 0000 0000 4400 001e 0002 c0fc 0008 adb6 8000 0000 0000 0000 0008 adc3 8000 0000 0000 0000 0000 0000 4400 001f
1762560  0002 c0fc 0000 0000 4400 001d 0002 c0fc 0008 ad41 8000 0000 0000 0000 0008 adf8 2400 0001 0002 c10c 0008 ae18 a000 0018
1762640  0000 0044 0008 ae28 a000 0001 0000 0048 0000 0000 4400 001d 0002 c120 0008 ae39 8000 0000 0000 0000 0008 ae46 8000 0000
1762720  0000 0000 0000 0000 4400 001e 0002 c120 0000 0000 4400 001c 0002 c120 0008 ae54 8000 0000 0000 0000 0008 ae72 2400 0001
1763000  0002 c130 0008 ae8d a000 0018 0000 0044 0000 0000 4400 001c 0002 c140 0008 ae9d 8000 0000 0000 0000 0000 0000 4400 001b
1763060  0002 c140 0008 aeaa 8000 0000 0000 0000 0008 aec3 2400 0001 0002 c150 0008 aee0 a000 000c 0000 0044 0008 aef0 a000 0001
1763140  0000 0048 0008 aefd 8400 0000 0002 c150 0000 0000 4400 0012 0002 c150 0008 af31 4000 000c 0000 0018 0000 0000 4400 0012
1763220  0002 c160 0008 af41 8000 0000 0000 0000 0008 af4e 8000 0000 0000 0000 0000 0000 4400 0013 00c2 c160 0000 0000 4400 0011
1763300  0002 c160 0000 0000 4400 0012 0002 c184 0000 0000 4400 0013 0002 c1b8 0008 af58 8000 0000 0000 0000 0008 af73 2400 0004
1763360  0002 c1c8 0008 af94 a000 0004 0000 0044 0008 afac a000 0004 0000 0048 0008 afbd 8400 0000 0002 c1c8 0000 0000 4400 0015
1763440  0002 c1c8 0000 0000 4400 0015 0002 c1dc 0008 afef 8000 0000 0000 0000 0008 affc 8000 0000 0000 0000 0000 0000 4400 0016
1763520  0002 c1dc 0000 0000 4400 0014 0002 c1dc 0008 b00a 8000 0000 0000 0000 0008 b029 0400 0000 0002 c1f8 0008 b036 0400 0000
1763600  0002 c464 0008 b044 0400 0000 0002 c884 0008 b056 0400 0000 0002 c56c 0008 b068 0400 0000 0002 c1f8 0008 b079 0400 0000
1763660  0002 c77c 0008 b088 0400 0000 0002 c674 0008 b09f c800 0000 0004 af20 0008 b0ae 0400 0000 0002 c35c 0008 b0be 0400 0000
1763740  0002 ccc8 0008 b0d5 0400 0000 0002 cd40 0008 b0f0 6400 0000 0002 c1f8 0008 b123 6400 0000 0002 c1f8 0008 b130 8400 0000
1764020  0002 c1f8 0008 b13f 8000 0000 0000 0000 0008 b169 8000 0000 0000 0000 0008 b183 8000 0000 0000 0000 0008 b1ae 8000 0000
1764100  0000 0000 0008 b1d0 8000 0000 0000 0000 0008 b1f3 8000 0000 0000 0000 0008 b219 8000 0000 0000 0000 0008 b23b 8000 0000
1764160  0000 0000 0008 b25c 8000 0000 0000 0000 0008 b275 8000 0000 0000 0000 0008 b290 8000 0000 0000 0000 0008 b2a4 8000 0000
1764240  0000 0000 0008 b2b6 8000 0004 ffff fb05 0008 b2d4 8000 0008 ffff fb05 0008 b311 8000 0001 ffff fb05 0008 b32e 8000 0004
1764320  ffff fb05 0008 b33c 2000 0004 0000 0000 0008 b349 2000 0004 0000 0000 0008 b359 2000 0001 0000 0000 0008 b378 2000 0004
1764400  0000 0000 0008 b383 2000 0004 0000 0000 0008 b390 2000 0004 0000 0000 0008 b39d 2000 0001 0000 0000 0008 b3ac 2000 0004
1764460  0000 0000 0008 b3ba 2000 0004 0000 0000 0008 b3c8 8000 0004 ffff fb05 0008 b3d9 8000 0004 ffff fb05 0008 b3e7 8000 0004
1764540  ffff fb05 0008 b3f8 8000 0004 ffff fb05 0008 b409 8000 0004 ffff fb05 0008 b480 8000 0004 ffff fb05 0008 b518 8000 0004
1764620  ffff fb05 0008 b55c 8000 0004 ffff fb05 0008 b5dc 8000 0004 ffff fb05 0008 b656 8000 0004 ffff fb05 0008 b684 8000 003c
1764700  ffff fb05 0008 b79b 8000 003c ffff fb05 0008 b897 2000 0004 0000 0000 0008 b8ae 2000 0004 0000 0000 0008 b8c7 2000 0004
1764760  0000 0000 0008 b8df 2000 0004 0000 0000 0008 b8f4 2000 0004 0000 0000 0008 b90a 2000 0001 0000 0000 0008 b923 8000 0000
1765040  0000 0000 0008 b9e9 8000 0000 0000 0000 0008 baaf 8000 0000 0000 0000 0008 bb6f 8000 0000 0000 0000 0008 bbc3 8000 0028
1765120  ffff fb05 0008 bcdd 8000 0028 ffff fb05 0008 bd42 8000 0000 0000 0000 0008 be0d 8000 0000 0000 0000 0008 bed8 8000 0000
1765200  0000 0000 0008 bf96 8000 0000 0000 0000 0008 c05a 8000 0000 0000 0000 0008 c11f 8000 0000 0000 0000 0008 c17e 8000 0048
1765260  ffff fb05 0008 c1fc 8000 0000 0000 0000 0008 c2c0 8000 0000 0000 0000 0008 c38a 8000 0000 0000 0000 0008 c45f 8000 0000
1765340  0000 0000 0008 c52b 8000 0000 0000 0000 0008 c5c9 8000 0044 ffff fb05 0008 c620 8000 0000 0000 0000 0008 c6e6 8000 0000
1765420  0000 0000 0008 c7b1 8000 0000 0000 0000 0008 c87e 8000 0000 0000 0000 0008 c8c0 2400 0044 0002 c1f8 0008 c8e0 a000 0044
1765500  0000 0044 0008 c8f0 a000 0001 0000 0048 0008 c8fc 8400 0000 0002 c1f8 0000 0000 4400 01d1 0002 c1f8 0008 c919 4000 0044
1765560  0000 0018 0000 0000 4400 01d1 0002 c208 0008 c929 8000 0000 0000 0000 0008 c936 8000 0000 0000 0000 0000 0000 4400 01d2
1765640  0002 c208 0000 0000 4400 01d3 0002 c23c 0000 0000 4400 01d4 0002 c2e0 0000 0000 4400 01d6 0002 c310 0000 0000 4400 01d8
1765720  0002 c340 0000 0000 4400 01d9 0002 c34c 0008 c940 8000 0000 0000 0000 0008 c955 8000 0050 ffff fb05 0008 c9d0 8000 0000
1766000  0000 0000 0008 ca57 2000 0000 0000 0000 0008 ca79 2000 0000 0000 0000 0008 ca9c 2000 0000 0000 0000 0008 caa9 2000 0000
1766060  0000 0000 0008 cab6 8000 0001 ffff fb05 0008 caf0 2000 0004 0000 0000 0008 cb12 2000 0004 0000 0000 0008 cb34 8000 0000
1766140  0000 0000 0008 cbc1 2800 0001 0004 af20 0008 cbd7 8000 0004 ffff fb05 0008 cbe3 8000 0008 ffff fb05 0008 cc46 8000 0000
1766220  0000 0000 0008 ccc2 8000 0004 ffff fb05 0008 ccf7 8000 0000 0000 0000 0008 cd4b 8000 0008 ffff fb05 0008 cdb6 8000 0000
1766300  0000 0000 0008 ce1c 8000 0004 ffff fb05 0008 ce51 8000 0000 0000 0000 0008 cead 8000 0008 ffff fb05 0008 cf10 8000 0000
1766360  0000 0000 0008 cf76 8000 0004 ffff fb05 0008 cfab 8000 0000 0000 0000 0008 d007 8000 0008 ffff fb05 0008 d075 8000 0000
1766440  0000 0000 0008 d102 8000 0004 ffff fb05 0008 d139 8000 0000 0000 0000 0008 d19b 8000 0008 ffff fb05 0008 d1f1 8000 0000
1766520  0000 0000 0008 d272 8000 0004 ffff fb05 0008 d2a9 8000 0000 0000 0000 0008 d301 8000 0008 ffff fb05 0008 d357 8000 0000
1766600  0000 0000 0008 d3c1 8000 0004 ffff fb05 0008 d3f8 8000 0000 0000 0000 0008 d458 8000 0008 ffff fb05 0008 d4ae 8000 0000
1766660  0000 0000 0008 d519 8000 0004 ffff fb05 0008 d54f 8000 0000 0000 0000 0008 d5af 8000 0008 ffff fb05 0008 d608 8000 0000
1766740  0000 0000 0008 d69a 8000 0004 ffff fb05 0008 d6d3 8000 0000 0000 0000 0008 d739 8000 0034 ffff fb05 0008 d852 8000 0034
1767020  ffff fb05 0008 d934 8000 0000 0000 0000 0008 d9fe 8000 0000 0000 0000 0008 da2b 8000 0040 ffff fb05 0008 db43 8000 0040
1767100  ffff fb05 0008 dc5d 2000 0004 0000 0000 0008 dc77 8000 0000 0000 0000 0008 dd44 8000 0000 0000 0000 0008 ddef 8000 0084
1767160  ffff fb05 0008 de74 8000 0000 0000 0000 0008 df49 8000 0000 0000 0000 0008 dfc5 8000 0004 ffff fb05 0008 dfd9 8000 0004
1767240  ffff fb05 0008 e015 8000 0004 ffff fb05 0008 e056 8000 0004 ffff fb05 0008 e094 8000 0004 ffff fb05 0008 e0cf 8000 0004
1767320  ffff fb05 0008 e10d 8000 0004 ffff fb05 0008 e12f 8000 0004 ffff fb05 0008 e151 2000 0001 0000 0000 0008 e160 8000 0004
1767400  ffff fb05 0008 e18f 8000 0000 0000 0000 0008 e214 2000 0008 0000 0000 0008 e23c 8000 0008 ffff fb05 0008 e247 8000 0008
1767460  ffff fb05 0008 e253 8000 0008 ffff fb05 0008 e25f 8000 0008 ffff fb05 0008 e2ab 8000 0000 0000 0000 0008 e371 8000 0000
```

| | | | | | | | | | | | | | | | | | | | | | | | | | |
|---|---|---|---|---|---|---|---|---|---|---|---|---|---|---|---|---|---|---|---|---|---|---|---|---|---|
| 1767540 | 0000 | 0000 | 0008 | e3d3 | 8000 | 0044 | ffff | fb05 | 0008 | e435 | 8000 | 0000 | 0000 | 0000 | 0008 | e4fb | 8000 | 0000 | 0000 | 0000 | 0008 | e526 | 8000 | 0008 |
| 1767620 | ffff | fb05 | 0008 | e532 | 8000 | 000c | ffff | fb05 | 0008 | e5a5 | 8000 | 0000 | 0000 | 0000 | 0008 | e631 | 8000 | 0008 | ffff | fb05 | 0008 | e685 | 8000 | 0000 |
| 1767700 | 0000 | 0000 | 0008 | e705 | 8000 | 000c | ffff | fb05 | 0008 | e77b | 8000 | 0000 | 0000 | 0000 | 0008 | e826 | 2000 | 0008 | 0000 | 0000 | 0008 | e850 | 8000 | 000c |
| 1767760 | ffff | fb05 | 0008 | e8b4 | 8000 | 0000 | 0000 | 0000 | 0008 | e975 | 8000 | 0000 | 0000 | 0000 | 0008 | e9e5 | 2000 | 0008 | 0000 | 0000 | 0008 | ea0b | 8000 | 000c |
| 1770040 | ffff | fb05 | 0008 | ea70 | 8000 | 0000 | 0000 | 0000 | 0008 | eb3e | 8000 | 0000 | 0000 | 0000 | 0008 | ebac | 2000 | 0008 | 0000 | 0000 | 0008 | ebd3 | 8000 | 0008 |
| 1770120 | ffff | fb05 | 0008 | ec34 | 8000 | 0000 | 0000 | 0000 | 0008 | ecdb | 8000 | 0010 | ffff | fb05 | 0008 | ed6b | 8000 | 0000 | 0000 | 0000 | 0008 | ee1c | 8000 | 0018 |
| 1770200 | ffff | fb05 | 0008 | eeac | 8000 | 0000 | 0000 | 0000 | 0008 | ef7c | 8000 | 0000 | 0000 | 0000 | 0008 | f004 | 2000 | 0008 | 0000 | 0000 | 0008 | f02c | 8000 | 002c |
| 1770260 | ffff | fb05 | 0008 | f14e | 8000 | 0000 | 0000 | 0000 | 0008 | f21a | 8000 | 0000 | 0000 | 0000 | 0008 | f21e | 2000 | 0008 | 0000 | 0000 | 0008 | f245 | 8000 | 0040 |
| 1770340 | ffff | fb05 | 0008 | f343 | 8000 | 0040 | ffff | fb05 | 0008 | f3e6 | 8000 | 0000 | 0000 | 0000 | 0008 | f49e | 2000 | 0008 | 0000 | 0000 | 0008 | f4c3 | 8000 | 004c |
| 1770420 | ffff | fb05 | 0008 | f5d5 | 8000 | 004c | ffff | fb05 | 0008 | f6d0 | 8000 | 0000 | 0000 | 0000 | 0008 | f7b2 | 8000 | 0000 | 0000 | 0000 | 0008 | f7b6 | 2000 | 0008 |
| 1770500 | 0000 | 0000 | 0008 | f7df | 8000 | 0038 | ffff | fb05 | 0008 | f8f1 | 8000 | 0038 | ffff | fb05 | 0008 | f972 | 8000 | 0000 | 0000 | 0000 | 0008 | fa54 | 8000 | 0000 |
| 1770560 | 0000 | 0000 | 0008 | fa58 | 2000 | 0008 | 0000 | 0000 | 0008 | fa81 | 8000 | 0030 | ffff | fb05 | 0008 | fbab | 8000 | 0030 | ffff | fb05 | 0008 | fbf0 | 8000 | 0000 |
| 1770640 | 0000 | 0000 | 0008 | fcb3 | 8000 | 0000 | 0000 | 0000 | 0008 | fd0b | 2000 | 0008 | 0000 | 0000 | 0008 | fd39 | 8000 | 0030 | ffff | fb05 | 0008 | fe3c | 8000 | 0030 |
| 1770720 | ffff | fb05 | 0008 | fe72 | 8000 | 0000 | 0000 | 0000 | 0008 | ff33 | 8000 | 0000 | 0000 | 0000 | 0008 | ff37 | 2000 | 0008 | 0000 | 0000 | 0008 | ff5d | 8000 | 0004 |
| 1771000 | ffff | fb05 | 0008 | ffd0 | 2400 | 002c | 0002 | c35c | 0008 | fff0 | a000 | 002c | 0000 | 0044 | 0009 | 0001 | 8400 | 0000 | 0002 | c35c | 0000 | 0000 | 4400 | 0006 |
| 1771060 | 0002 | c35c | 0009 | 0011 | 4000 | 002c | 0000 | 0018 | 0000 | 0000 | 4400 | 0006 | 0002 | c368 | 0009 | 0022 | 8000 | 0004 | ffff | fffc | 0000 | 0000 | c000 | 0002 |
| 1771140 | 0000 | 0170 | 0009 | 0039 | 8000 | 0000 | 0000 | 0000 | 0000 | 0000 | 4400 | 0005 | 0002 | c368 | 0000 | 0000 | 4400 | 0006 | 0002 | c438 | 0000 | 0000 | 4400 | 0007 |
| 1771220 | 0002 | c43c | 0000 | 0000 | 4400 | 0013 | 0002 | c448 | 0000 | 0000 | e000 | 0002 | 0000 | 025c | 0000 | 0000 | 4400 | 0014 | 0002 | c454 | 0009 | 0046 | 8000 | 0000 |
| 1771300 | 0000 | 0000 | 0009 | 005a | 2400 | 0040 | 0002 | c464 | 0009 | 0078 | a000 | 0040 | 0000 | 0044 | 0009 | 0089 | 8400 | 0000 | 0002 | c464 | 0000 | 0000 | 4400 | 0006 |
| 1771360 | 0002 | c464 | 0009 | 0097 | 4000 | 0040 | 0000 | 0018 | 0000 | 0000 | 4400 | 0006 | 0002 | c470 | 0009 | 00a8 | 8000 | 0004 | ffff | fffc | 0000 | 0000 | c000 | 0002 |
| 1771440 | 0000 | 0278 | 0009 | 00bf | 8000 | 0000 | 0000 | 0000 | 0000 | 0000 | 4400 | 0005 | 0002 | c470 | 0000 | 0000 | 4400 | 0006 | 0002 | c540 | 0000 | 0000 | 4400 | 0007 |
| 1771520 | 0002 | c544 | 0000 | 0000 | 4400 | 001a | 0002 | c550 | 0000 | 0000 | e000 | 0002 | 0000 | 0364 | 0000 | 0000 | 4400 | 001b | 0002 | c55c | 0009 | 00cc | 8000 | 0000 |
| 1771600 | 0000 | 0000 | 0009 | 00de | 2400 | 0038 | 0002 | c56c | 0009 | 0100 | a000 | 0038 | 0000 | 0044 | 0009 | 0111 | 8400 | 0000 | 0002 | c56c | 0000 | 0000 | 4400 | 0007 |
| 1771660 | 0002 | c56c | 0009 | 0123 | 4000 | 0038 | 0000 | 0018 | 0000 | 0000 | 4400 | 0007 | 0002 | c578 | 0009 | 0134 | 8000 | 0004 | ffff | fffc | 0000 | 0000 | c000 | 0002 |
| 1771740 | 0000 | 0380 | 0009 | 014b | 8000 | 0000 | 0000 | 0000 | 0000 | 0000 | 4400 | 0006 | 0002 | c578 | 0000 | 0000 | 4400 | 0007 | 0002 | c648 | 0000 | 0000 | 4400 | 0008 |
| 1772020 | 0002 | c64c | 0000 | 0000 | 4400 | 0018 | 0002 | c658 | 0000 | 0000 | e000 | 0002 | 0000 | 046c | 0000 | 0000 | 4400 | 0019 | 0002 | c664 | 0009 | 0158 | 8000 | 0000 |
| 1772100 | 0000 | 0000 | 0009 | 016e | 2400 | 0030 | 0002 | c674 | 0009 | 0195 | a000 | 0030 | 0000 | 0044 | 0009 | 01a6 | 8400 | 0000 | 0002 | c674 | 0000 | 0000 | 4400 | 0007 |
| 1772160 | 0002 | c674 | 0009 | 01bc | 4000 | 0030 | 0000 | 0018 | 0000 | 0000 | 4400 | 0007 | 0002 | c680 | 0009 | 01cd | 8000 | 0004 | ffff | fffc | 0000 | 0000 | c000 | 0002 |
| 1772240 | 0000 | 0488 | 0009 | 01e4 | 8000 | 0000 | 0000 | 0000 | 0000 | 0000 | 4400 | 0006 | 0002 | c680 | 0000 | 0000 | 4400 | 0007 | 0002 | c750 | 0000 | 0000 | 4400 | 0008 |
| 1772320 | 0002 | c754 | 0000 | 0000 | 4400 | 0016 | 0002 | c760 | 0000 | 0000 | e000 | 0002 | 0000 | 0574 | 0000 | 0000 | 4400 | 0017 | 0002 | c76c | 0009 | 01f1 | 8000 | 0000 |
| 1772400 | 0000 | 0000 | 0009 | 020c | 2400 | 0030 | 0002 | c77c | 0009 | 022b | a000 | 0030 | 0000 | 0044 | 0009 | 023c | 8400 | 0000 | 0002 | c77c | 0000 | 0000 | 4400 | 0007 |
| 1772460 | 0002 | c77c | 0009 | 024b | 4000 | 0030 | 0000 | 0018 | 0000 | 0000 | 4400 | 0007 | 0002 | c788 | 0009 | 025c | 8000 | 0004 | ffff | fffc | 0000 | 0000 | c000 | 0002 |
| 1772540 | 0000 | 0590 | 0009 | 0273 | 8000 | 0000 | 0000 | 0000 | 0000 | 0000 | 4400 | 0006 | 0002 | c788 | 0000 | 0000 | 4400 | 0007 | 0002 | c858 | 0000 | 0000 | 4400 | 0008 |
| 1772620 | 0002 | c85c | 0000 | 0000 | 4400 | 0017 | 0002 | c868 | 0000 | 0000 | e000 | 0002 | 0000 | 067c | 0000 | 0000 | 4400 | 0018 | 0002 | c874 | 0009 | 0280 | 8000 | 0000 |
| 1772700 | 0000 | 0000 | 0009 | 0293 | 2400 | 004c | 0002 | c884 | 0009 | 02b5 | a000 | 004c | 0000 | 0044 | 0009 | 02c6 | 8400 | 0000 | 0002 | c884 | 0000 | 0000 | 4400 | 0006 |
| 1772760 | 0002 | c884 | 0009 | 02d8 | 4000 | 004c | 0000 | 0016 | 0000 | 0000 | 4400 | 0006 | 0002 | c890 | 0009 | 02e9 | 8000 | 0004 | ffff | fffc | 0000 | 0000 | c000 | 0002 |
| 1773040 | 0000 | 0698 | 0009 | 0300 | 8000 | 0000 | 0000 | 0000 | 0000 | 0000 | 4400 | 0005 | 0002 | c890 | 0000 | 0000 | 4400 | 0006 | 0002 | c960 | 0000 | 0000 | 4400 | 0007 |
| 1773120 | 0002 | c964 | 0000 | 0000 | 4400 | 001c | 0002 | c970 | 0000 | 0000 | e000 | 0002 | 0000 | 0784 | 0000 | 0000 | 4400 | 001d | 0002 | c97c | 0009 | 030d | 8000 | 0000 |
| 1773200 | 0000 | 0000 | 0009 | 0323 | 2400 | 0018 | 0002 | c98c | 0009 | 034e | a000 | 0001 | 0000 | 0044 | 0009 | 035e | a000 | 0001 | 0000 | 0048 | 0009 | 0371 | 8400 | 0000 |
| 1773260 | 0002 | c98c | 0000 | 0000 | 4400 | 0024 | 0002 | c98c | 0000 | 0000 | 4400 | 0024 | 0002 | c9a0 | 0009 | 0380 | 8000 | 0018 | ffff | fffc | 0009 | 0392 | 8000 | 0004 |
| 1773340 | ffff | fff8 | 0000 | 0000 | c000 | 0002 | 0000 | 07a8 | 0009 | 03a6 | 8000 | 0000 | 0000 | 0000 | 0000 | 0000 | 4400 | 0028 | 0002 | c9a0 | 0009 | 03b3 | 8000 | 0000 |
| 1773420 | 0000 | 0000 | 0000 | 0000 | 4400 | 0029 | 0002 | c9a0 | 0009 | 03c3 | 8000 | 0000 | 0000 | 0000 | 0000 | 0000 | 4400 | 002a | 0002 | c9a0 | 0009 | 03d2 | 8000 | 0000 |
| 1773500 | 0000 | 0000 | 0000 | 0000 | 4400 | 002b | 0002 | c9a0 | 0000 | 0000 | 4400 | 0027 | 0002 | c9a0 | 0000 | 0000 | 4400 | 0029 | 0002 | c9a4 | 0000 | 0000 | 4400 | 002a |
| 1773560 | 0002 | c9c4 | 0000 | 0000 | 4400 | 002b | 0002 | c9f4 | 0000 | 0000 | 4400 | 002c | 0002 | ca24 | 0000 | 0000 | 4400 | 002d | 0002 | ca54 | 0000 | 0000 | 4400 | 002e |
| 1773640 | 0002 | ca84 | 0000 | 0000 | 4400 | 002f | 0002 | cab4 | 0000 | 0000 | 4400 | 0032 | 0002 | cae4 | 0000 | 0000 | 4400 | 0033 | 0002 | cb04 | 0000 | 0000 | 4400 | 0036 |
| 1773720 | 0002 | cb08 | 0000 | 0000 | 4400 | 0037 | 0002 | cb18 | 0000 | 0000 | 4400 | 0038 | 0002 | cb3c | 0000 | 0000 | 4400 | 003c | 0002 | cb48 | 0000 | 0000 | 4400 | 003e |
| 1774000 | 0002 | cb50 | 0000 | 0000 | 4400 | 003f | 0002 | cb60 | 0000 | 0000 | 4400 | 0042 | 0002 | cb68 | 0000 | 0000 | 4400 | 0043 | 0002 | cb78 | 0000 | 0000 | 4400 | 0046 |
| 1774060 | 0002 | cb80 | 0000 | 0000 | 4400 | 0047 | 0002 | cb90 | 0000 | 0000 | 4400 | 004a | 0002 | cb98 | 0000 | 0000 | 4400 | 004b | 0002 | cba8 | 0000 | 0000 | 4400 | 004e |
| 1774140 | 0002 | cbb0 | 0000 | 0000 | 4400 | 004f | 0002 | cbc0 | 0000 | 0000 | 4400 | 0052 | 0002 | cbc8 | 0000 | 0000 | 4400 | 0053 | 0002 | cbd8 | 0000 | 0000 | 4400 | 0057 |
| 1774220 | 0002 | cbe0 | 0000 | 0000 | 4400 | 0058 | 0002 | cc04 | 0000 | 0000 | 4400 | 003c | 0002 | cc10 | 0000 | 0000 | 4400 | 005b | 0002 | cc50 | 0000 | 0000 | e000 | 0002 |
| 1774300 | 0000 | 0a64 | 0000 | 0000 | 4400 | 005c | 0002 | cc5c | 0009 | 03e4 | 8000 | 0000 | 0000 | 0000 | 0009 | 0403 | 2400 | 0001 | 0002 | cc6c | 0009 | 0434 | 8400 | 0000 |
| 1774360 | 0002 | cc6c | 0000 | 0000 | 4400 | 023b | 0002 | cc6c | 0000 | 0000 | 4400 | 023b | 0002 | cc78 | 0000 | 0000 | 4400 | 023c | 0002 | cc88 | 0009 | 0451 | 2400 | 0001 |
| 1774440 | 0002 | cc98 | 0000 | 0000 | 4400 | 023b | 0002 | cc98 | 0000 | 0000 | 4400 | 023b | 0002 | cca4 | 0000 | 0000 | 4400 | 023c | 0002 | ccb8 | 0009 | 0482 | 2000 | 0008 |
| 1774520 | 0000 | 0000 | 0009 | 04c0 | 2400 | 0001 | 0002 | ccc8 | 0009 | 04dd | a000 | 000c | 0000 | 0044 | 0009 | 04f6 | a000 | 0001 | 0000 | 0048 | 0009 | 0503 | 8400 | 0000 |
| 1774600 | 0002 | ccc8 | 0000 | 0000 | 4400 | 0012 | 0002 | ccc8 | 0009 | 0537 | 4000 | 000c | 0000 | 0018 | 0000 | 0000 | 4400 | 0012 | 0002 | ccd8 | 0009 | 0548 | 8000 | 0000 |

```
1774660 0000 0000 0009 0555 8000 0000 0000 0000 0000 0000 4400 0013 0002 ccd8 0000 0000 4400 0011 0002 ccd8 0000 0000 4400 0012
1774740 0002 ccfc 0000 0000 4400 0013 0002 cd30 0009 055f 8000 0000 0000 0000 0009 057a 2400 0004 0002 cd40 0009 059b a000 0004
1775020 0000 0044 0009 05b4 a000 0004 0000 0048 0009 05c6 8400 0000 0002 cd40 0000 0000 4400 0015 0002 cd40 0000 0000 4400 0015
1775100 0002 cd54 0009 05f8 8000 0000 0000 0000 0009 0605 8000 0000 0000 0000 0000 0000 4400 0016 0002 cd54 0000 0000 4400 0014
1775160 0002 cd54 0009 0613 8000 0000 0000 0000 0009 0632 0400 0000 0002 cd70 0009 063c 0600 0000 0004 2890 0009 0644 6400 0000
1775240 0002 cd70 0009 0661 6400 0000 0002 cd70 0009 0670 8000 0000 0000 0000 0009 069a 8000 0000 0000 0000 0009 06b4 8000 0000
1775320 0000 0000 0009 06df 8000 0000 0000 0000 0009 0701 8000 0000 0000 0000 0009 0724 8000 0000 0000 0000 0009 074a 8000 0000
1775400 0000 0000 0009 076c 8000 0000 0000 0000 0009 078d 8000 0000 0000 0000 0009 07a6 8000 0000 0000 0000 0009 07c1 8000 0000
1775460 0000 0000 0009 07d5 8000 0000 0000 0000 0009 07e7 2600 0001 0004 2890 0009 0809 c200 0000 0000 0000 0009 081f c200 0000
1775540 0000 0ff2 0009 0834 c200 0000 0000 03a3 0009 094b 2400 0004 0002 cd70 0009 085a a000 0001 0000 0044 0009 0868 a000 0001
1775620 0000 0048 0000 0000 4400 0012 0002 cd70 0000 0000 4400 0012 0002 cd84 0000 0000 4400 0014 0002 cd84 0000 0000 4400 0016
1775700 0002 cda4 0009 0974 2400 0004 0002 cdb4 0009 0984 a000 0014 0000 0044 0009 0898 a000 0001 0000 0048 0009 08a6 a000 0001
1775760 0000 004c 0000 0000 4400 0021 0002 cdb4 0000 0000 4400 0021 0002 cdcc 0009 08b2 8000 0001 ffff ffe0 0009 08d3 8000 0004
1776040 ffff ffdc 0009 09db 8000 0004 ffff ffd8 0009 08e3 8000 0004 ffff ffd4 0009 08eb 8000 0004 ffff ffd0 0009 08f6 8000 0004
1776120 ffff ffcc 0009 0901 8000 0004 ffff ffc8 0009 090c 8000 0008 ffff ffc0 0009 091b 8000 0004 ffff ffbc 0000 0000 c000 0002
1776200 0000 005c 0000 0000 4400 002d 0002 cdcc 0000 0000 4400 002e 0002 cdd0 0000 0000 4400 002f 0002 cdd4 0000 0000 4400 0031
1776260 0002 cdf0 0000 0000 4400 0032 0002 ce00 0000 0000 4400 0033 0002 ce08 0000 0000 4400 0035 0002 ce24 0000 0000 4400 0037
1776340 0002 ce7c 0000 0000 4400 0038 0002 ce9c 0000 0000 4400 003a 0002 ceb0 0000 0000 4400 003b 0002 cebc 0000 0000 4400 0040
1776420 0002 ced8 0000 0000 4400 0042 0002 cedc 0000 0000 4400 0044 0002 cf40 0000 0000 4400 0045 0002 cf64 0000 0000 4400 0046
1776500 0002 cf70 0000 0000 4400 0047 0002 cf9c 0000 0000 4400 0049 0002 cfa4 0000 0000 4400 004b 0002 cfd8 0000 0000 4400 004c
1776560 0002 cff8 0000 0000 4400 004d 0002 d004 0000 0000 4400 004e 0002 d010 0000 0000 4400 0051 0002 d018 0000 0000 4400 0052
1776640 0002 d02c 0000 0000 4400 005b 0002 d034 0000 0000 4400 005e 0002 d03c 0000 0000 4400 005f 0002 d050 0000 0000 4400 0060
1776720 0002 d068 0000 0000 4400 0062 0002 d070 0000 0000 4400 0063 0002 d084 0000 0000 4400 0064 0002 d098 0000 0000 4400 0065
1777000 0002 d0b4 0000 0000 4400 0067 0002 d0bc 0000 0000 4400 0068 0002 d0d0 0000 0000 4400 0069 0002 d0e4 0000 0000 4400 006a
1777060 0002 d0f8 0000 0000 4400 006b 0002 d118 0000 0000 4400 005b 0002 d120 0000 0000 4400 006d 0002 d140 0000 0000 4400 0074
1777140 0002 d148 0000 0000 4400 0077 0002 d150 0000 0000 4400 0078 0002 d168 0000 0000 4400 0079 0002 d134 0000 0000 4400 007b
1777220 0002 d18c 0000 0000 4400 007c 0002 d1a0 0000 0000 4400 007d 0002 d1b8 0000 0000 4400 007e 0002 d1d8 0000 0000 4400 0080
1777300 0002 d1e0 0000 0000 4400 0081 0002 d1f4 0000 0000 4400 0082 0002 d208 0000 0000 4400 0084 0002 d220 0000 0000 4400 0085
1777360 0002 d244 0000 0000 4400 0074 0002 d24c 0000 0000 4400 0087 0002 d26c 0000 0000 4400 004e 0002 d274 0000 0000 4400 008c
1777440 0002 d394 0000 0000 4400 008d 0002 d3ac 0000 0000 4400 0090 0002 d3b4 0000 0000 4400 0091 0002 d3c4 0000 0000 4400 0092
1777520 0002 d3d0 0000 0000 4400 0093 0002 d3e0 0000 0000 4400 0095 0002 d3e8 0000 0000 e000 0002 0000 0694 0000 0000 4400 0097
1777600 0002 d404 0009 0925 2400 0001 0002 d414 0009 0935 a000 0001 0000 0044 0009 0943 a000 0001 0000 0048 0009 0951 a000 0001
1777660 0000 004c 0000 0000 4400 00a2 0002 d414 0000 0000 4400 00a2 0002 d42c 0009 095d 8000 0001 ffff ffe0 0009 096b 8000 0004
1777740 ffff ffdc 0009 0973 8000 0004 ffff ffd8 0009 097b 8000 0004 ffff ffd4 0009 0983 8000 0004 ffff ffd0 0009 098e 8000 0004
2000020 ffff ffcc 0009 0999 8000 0004 ffff ffc8 0009 09a4 8000 0008 ffff ffc0 0000 0000 c000 0002 0000 06bc 0000 0000 4400 00ad
2000100 0002 d42c 0000 0000 4400 00ae 0002 d434 0000 0000 4400 00af 0002 d438 0000 0000 4400 00b1 0002 d454 0000 0000 4400 00b2
2000160 0002 d464 0000 0000 4400 00b3 0002 d46c 0000 0000 4400 00b5 0002 d488 0000 0000 4400 00b7 0002 d4e0 0000 0000 4400 00b8
2000240 0002 d500 0000 0000 4400 00ba 0002 d514 0000 0000 4400 00bb 0002 d520 0000 0000 4400 00c0 0002 d548 0000 0000 4400 00c2
2000320 0002 d54c 0000 0000 4400 00c4 0002 d5b0 0000 0000 4400 00c5 0002 d5d4 0000 0000 4400 00c6 0002 d5e0 0000 0000 4400 00c7
2000400 0002 d600 0000 0000 4400 00c9 0002 d614 0000 0000 4400 00cb 0002 d648 0000 0000 4400 00cc 0002 d668 0000 0000 4400 00cd
2000460 0002 d674 0000 0000 4400 00ce 0002 d680 0000 0000 4400 00d1 0002 d688 0000 0000 4400 00d2 0002 d6a8 0000 0000 4400 00db
2000540 0002 d6b0 0000 0000 4400 00de 0002 d6b8 0000 0000 4400 00e0 0002 d6cc 0000 0000 4400 00e1 0002 d6f0 0000 0000 4400 00e3
2000620 0002 d6f8 0000 0000 4400 00e4 0002 d70c 0000 0000 4400 00e6 0002 d720 0000 0000 4400 00e7 0002 d748 0000 0000 4400 00e9
2000700 0002 d750 0000 0000 4400 00ea 0002 d764 0000 0000 4400 00eb 0002 d778 0000 0000 4400 00ed 0002 d79c 0000 0000 4400 00ee
2000760 0002 d7b8 0000 0000 4400 00db 0002 d7c0 0000 0000 4400 00f0 0002 d7e0 0000 0000 4400 00f7 0002 d7e8 0000 0000 4400 00fa
2001040 0002 d7f0 0000 0000 4400 00fc 0002 d808 0000 0000 4400 00fd 0002 d830 0000 0000 4400 00ff 0002 d838 0000 0000 4400 0100
2001120 0002 d84c 0000 0000 4400 0102 0002 d864 0000 0000 4400 0103 0002 d890 0000 0000 4400 0105 0002 d898 0000 0000 4400 0106
2001200 0002 d8ac 0000 0000 4400 0107 0002 d8c0 0000 0000 4400 0109 0002 d8d8 0000 0000 4400 010a 0002 d908 0000 0000 4400 00f7
2001260 0002 d910 0000 0000 4400 010c 0002 d930 0000 0000 4400 00ce 0002 d938 0000 0000 4400 0111 0002 da58 0000 0000 4400 0112
2001340 0002 da70 0000 0000 4400 0115 0002 da78 0000 0000 4400 0117 0002 da90 0000 0000 e000 0002 0000 012c 0000 0000 4400 0119
2001420 0002 da9c 0009 09b3 0400 0000 0002 dab0 0009 09bd 0600 0000 0004 29bc 0009 09c4 0600 0000 0004 2a00 0009 09cf 0600 0000
2001500 0004 2978 0009 09d6 0600 0000 0004 2a04 0009 09e1 0600 0000 0004 2930 0009 09e9 6400 0000 0002 dab0 0009 0a06 6400 0000
2001560 0002 dab0 0009 0a15 8000 0000 0000 0000 0009 0a3f 8000 0000 0000 0000 0009 0a59 8000 0000 0000 0000 0009 0a84 8000 0000
2001640 0000 0000 0009 0aa6 8000 0000 0000 0000 0009 0ac9 8000 0000 0000 0000 0009 0aef 8000 0000 0000 0000 0009 0b11 8000 0000
2001720 0000 0000 0009 0b32 8000 0000 0000 0000 0009 0b4b 8000 0000 0000 0000 0009 0b66 8000 0000 0000 0000 0009 0b7a 8000 0000
```

```
2002000 0000 0000 0009 0b8c 2600 0001 0004 2930 0009 0bae c200 0000 0000 0ff2 0009 0bc3 c200 0000 0000 03a3 0009 0bda 8200 0000
2002060 0000 078d 0009 0be7 8400 0000 0002 dab0 0009 0bf4 2600 0001 0004 2978 0000 0000 a200 0000 0000 0000 0009 0c14 8200 0000
2002140 0000 0cb7 0009 0c1e 8400 0000 0002 dab0 0009 0c28 2600 0001 0004 29bc 0009 0c35 8000 0004 ffff fb05 0009 0c49 8000 0004
2002220 ffff fb05 0000 0000 a200 0000 0000 0000 0009 0c58 8000 0008 ffff fb05 0009 0cb7 8000 0008 ffff fb05 0009 0cd4 8000 0008
2002300 ffff fb05 0009 0cea 2600 0008 0004 2a00 0009 0cfc 8400 0000 0002 dab0 0009 0d0b 2600 0008 0004 2a04 0009 0d1d 2400 0000
2002360 0002 dab0 0009 0d38 a000 0004 0000 0044 0000 0000 4400 002a 0002 dab0 0000 0000 4400 002a 0002 dad4 0009 0d52 8000 0001
2002440 ffff fffc 0009 0d5d 8000 0004 ffff fff8 0000 0000 c000 0002 0000 0024 0000 0000 4400 002f 0002 dad4 0000 0000 4400 0030
2002520 0002 dadc 0000 0000 4400 0031 0002 daf0 0000 0000 e000 0002 0000 0050 0000 0000 4400 0034 0002 db00 0009 0d6d 2400 0000
2002600 0002 db08 0009 0d85 a000 0000 0000 0044 0000 0000 4400 0043 0002 db08 0000 0000 4400 0043 0002 db18 0009 0d95 8000 0008
2002660 ffff fffc 0000 0000 c000 0002 0000 0068 0000 0000 4400 0047 0002 db18 0000 0000 4400 0049 0002 db2c 0000 0000 4400 004a
2002740 0002 db3c 0000 0000 4400 004c 0002 db4c 0000 0000 4400 004d 0002 db58 0000 0000 4400 004e 0002 db68 0000 0000 4400 0051
2003020 0002 db7c 0000 0000 4400 0052 0002 db7c 0000 0000 4400 0056 0002 dba0 0000 0000 4400 0057 0002 dbac 0000 0000 4400 0058
2003100 0002 dbc0 0000 0000 4400 0059 0002 dbcc 0000 0000 4400 005a 0002 dbdc 0000 0000 e000 0002 0000 0138 0000 0000 4400 005d
2003160 0002 dbe8 0009 0da1 2400 0000 0002 dbf0 0000 0000 4400 006c 0002 dbf0 0000 0000 4400 006c 0002 dbfc 0009 0db8 8000 0008
2003240 ffff fffc 0009 0dc4 8000 0000 ffff fff8 0000 0000 c000 0002 0000 014c 0000 0000 4400 0071 0002 dbfc 0000 0000 4400 0073
2003320 0002 dc10 0000 0000 4400 0074 0002 dc1c 0000 0000 4400 0075 0002 dc28 0000 0000 4400 0076 0002 dc38 0000 0000 4400 0077
2003400 0002 dc48 0000 0000 4400 007b 0002 dc5c 0000 0000 4400 007c 0002 dc5c 0000 0000 4400 007d 0002 dc74 0000 0000 4400 007f
2003460 0002 dc78 0000 0000 e000 0002 0000 01d4 0000 0000 4400 0081 0002 dc84 0009 0dd3 2400 0004 0002 dc94 0000 0000 4400 008b
2003540 0002 dc94 0000 0000 4400 008b 0002 dcb0 0000 0000 4400 008d 0002 dca0 0000 0000 4400 008f 0002 dccc 0009 0dec 2400 0000
2003620 0002 dcdc 0009 0e06 a000 0004 0000 0044 0009 0e17 a000 0001 0000 0048 0000 0000 4400 00a4 0002 dcdc 0000 0000 4400 00a4
2003700 0002 dcf0 0009 0e23 8000 0000 ffff fffc 0000 0000 c000 0002 0000 0240 0000 0000 4400 00a8 0002 dcf0 0000 0000 4400 00aa
2003760 0002 dd04 0000 0000 4400 00ab 0002 dd10 0000 0000 4400 00ac 0002 dd24 0000 0000 4400 00af 0002 dd38 0000 0000 e000 0002
2004040 0000 0298 0000 0000 4400 00b1 0002 dd46 0009 0e32 2400 0000 0002 dd50 0009 0e4d a000 0004 0000 0044 0009 0e5e a000 0001
2004120 0000 0048 0000 0000 4400 00c2 0002 dd50 0000 0000 4400 00c2 0002 dd64 0000 0000 4400 00c5 0002 dd64 0000 0000 4400 00c9
2004200 0002 dd88 0000 0000 4400 00ca 0002 ddc8 0000 0000 4400 00cc 0002 ddd8 0000 0000 4400 00ce 0002 dde4 0009 0e6a 2400 0000
2004260 0002 ddec 0009 0e82 a000 0000 0000 0044 0000 0000 4400 00da 0002 ddec 0000 0000 4400 00da 0002 ddfc 0000 0000 4400 00dc
2004340 0002 ddfc 0000 0000 4400 00dd 0002 de14 0000 0000 4400 00df 0002 de2c 0009 0e91 0400 0000 0002 de38 0009 0e9b 0600 0000
2004420 0004 2bcc 0009 0ea1 0600 0000 0004 2ab4 0009 0ea8 0600 0000 0004 2a70 0009 0eaf 0600 0000 0004 2b40 0009 0ebd 0600 0000
2004500 0004 2af8 0009 0ec9 0600 0000 0004 2bd0 0009 0ed8 0400 0000 0002 df14 0009 0eec 0600 0000 0004 2a28 0009 0ef4 6400 0000
2004560 0002 de38 0009 0f11 6400 0000 0002 de38 0009 0f20 8000 0000 0000 0000 0009 0f4a 8000 0000 0000 0000 0009 0f64 8000 0000
2004640 0000 0000 0009 0f8f 8000 0000 0000 0000 0009 0fb1 8000 0000 0000 0000 0009 0fd4 8000 0000 0000 0000 0009 0ffa 8000 0000
2004720 0000 0000 0009 101c 8000 0000 0000 0000 0009 103d 8000 0000 0000 0000 0009 1056 8000 0000 0000 0000 0009 1071 8000 0000
2005000 0000 0000 0009 1085 8000 0000 0000 0000 0009 1097 2600 0001 0004 2a28 0009 10b9 c200 0000 0000 0000 0009 10cf 8200 0000
2005060 0000 078d 0009 10dc 8400 0000 0002 de38 0009 10e9 2600 0001 0004 2a70 0000 0000 a200 0000 0000 0000 0009 1109 8200 0000
2005140 0000 0cb7 0009 1113 8400 0000 0002 de38 0009 111d 2600 0001 0004 2ab4 0009 112a 8000 0004 ffff fb05 0009 113e 8000 0004
2005220 ffff fb05 0000 0000 a200 0000 0000 0000 0009 114d 8200 0000 0000 0e93 0009 115c 8400 0000 0002 de38 0009 116b 2600 0001
2005300 0004 2af8 0009 117e 2600 0001 0004 2b40 0000 0000 a200 0000 0000 0000 0009 11ac 8000 0010 ffff fb05 0009 1223 8000 0010
2005360 ffff fb05 0009 1240 8000 0010 ffff fb05 0009 1256 2600 0004 0004 2bcc 0009 1262 8400 0000 0002 de38 0009 1271 2600 0010
2005440 0004 2bd0 0009 1287 2400 0004 0002 de38 0009 12a0 a000 0001 0000 0044 0000 0000 4400 0028 0002 de38 0000 0000 4400 0028
2005520 0002 de48 0009 12ae 8000 0010 ffff fffc 0009 12c3 8000 0004 ffff fff8 0000 0000 c000 0002 0000 0010 0000 0000 4400 002e
2005600 0002 de48 0000 0000 4400 002f 0002 de60 0000 0000 4400 0031 0002 de74 0000 0000 4400 0032 0002 de80 0000 0000 4400 0034
2005660 0002 de94 0000 0000 4400 0035 0002 deb0 0000 0000 4400 0037 0002 dec8 0000 0000 4400 0039 0002 dee0 0000 0000 4400 003b
2005740 0002 def8 0000 0000 e000 0002 0000 00cc 0000 0000 4400 003d 0002 df04 0009 12d3 2400 0010 0002 df14 0009 12ec a000 0004
2006020 0000 0044 0009 12ff a000 0001 0000 0048 0000 0000 4400 0046 0002 df14 0000 0000 4400 0046 0002 df28 0009 130d 8000 0010
2006100 ffff fffc 0000 0000 c000 0002 0000 00fc 0000 0000 4400 004a 0002 df28 0000 0000 4400 004b 0002 df38 0000 0000 4400 004d
2006160 0002 df48 0000 0000 4400 004e 0002 df54 0000 0000 4400 004f 0002 df74 0000 0000 4400 0050 0002 df88 0000 0000 4400 0053
2006240 0002 dfa4 0000 0000 4400 0054 0002 dfa4 0000 0000 4400 0055 0002 dfd0 0000 0000 4400 0057 0002 dfe0 0000 0000 4400 0058
2006320 0002 dfe8 0000 0000 4400 005b 0002 dff8 0000 0000 4400 005c 0002 dff8 0000 0000 4400 005d 0002 e014 0000 0000 e000 0002
2006400 0000 01e8 0000 0000 4400 005f 0002 e020 0009 1319 2400 0001 0002 e030 0009 1338 a000 0004 0000 0044 0000 0000 4400 0070
2006460 0002 e030 0000 0000 4400 0070 0002 e040 0009 1349 8000 0010 ffff fffc 0009 1355 8000 0001 ffff fff8 0000 0000 c000 0002
2006540 0000 0208 0000 0000 4400 0075 0002 e040 0000 0000 4400 0077 0002 e050 0000 0000 4400 0078 0002 e05c 0000 0000 4400 0079
2006620 0002 e084 0000 0000 4400 007a 0002 e09c 0000 0000 4400 007c 0002 e0b0 0000 0000 4400 007d 0002 e0c4 0000 0000 4400 007e
2006700 0002 e0d4 0000 0000 4400 0081 0002 e0e8 0000 0000 4400 0082 0002 e0e8 0000 0000 4400 0083 0002 e104 0000 0000 4400 0086
2006760 0002 e110 0000 0000 4400 0087 0002 e120 0000 0000 4400 008a 0002 e140 0000 0000 4400 008b 0002 e140 0000 0000 4400 008c
2007040 0002 e15c 0000 0000 4400 008e 0002 e160 0000 0000 e000 0002 0000 0334 0000 0000 4400 0090 0002 e16c 0009 1362 0400 0000
```

```
2007120 0002 e180 0009 1367 0400 0000 0002 ee68 0009 137a 0400 0000 0002 edec 0009 1392 0600 0000 0004 32a4 0009 13a3 0600 0000
2007200 0004 31c0 0009 13aa 0400 0000 0002 ed28 0009 13be 0600 0000 0004 3444 0009 13d4 0400 0000 0002 ec40 0009 13e2 0600 0000
2007260 0004 3204 0009 13e9 0600 0000 0004 317c 0009 13f0 0600 0000 0004 3248 0009 13fb 0600 0000 0004 3490 0009 1407 0400 0000
2007340 0002 e818 0009 141a 0400 0000 0002 efd0 0009 1429 0800 0000 0004 af28 0009 1434 0600 0000 0004 32a8 0009 1443 0600 0000
2007420 0004 32ac 0009 1452 0400 0000 0002 e79c 0009 1461 0600 0000 0004 348c 0009 146d 0600 0000 0004 3494 0009 1478 0600 0000
2007500 0004 32b0 0009 147d 0400 0000 0002 e558 0009 1490 0600 0000 0004 3138 0009 1498 0400 0000 0002 e1a8 0009 14b2 0600 0000
2007560 0004 3498 0009 14bf 0400 0000 0002 e830 0009 14dd 6400 0000 0002 e180 0009 14fa 6400 0000 0002 e180 0009 1504 8000 0000
2007640 0000 0000 0009 152e 8000 0000 0000 0000 0009 1548 8000 0000 0000 0000 0009 1573 8000 0000 0000 0000 0009 1595 8000 0000
2007720 0000 0000 0009 15b8 8000 0000 0000 0000 0009 15de 8000 0000 0000 0000 0009 1600 8000 0000 0000 0000 0009 1621 8000 0000
2010000 0000 0000 0009 163a 8000 0000 0000 0000 0009 1655 8000 0000 0000 0000 0009 1669 8000 0000 0000 0000 0009 167b 2600 0001
2010060 0004 3138 0009 1593 8200 0000 0000 067d 0009 16aa 8400 0000 0002 e180 0009 16b7 2600 0001 0004 317c 0000 0000 a200 0000
2010140 0000 0000 0009 16c5 8200 0000 0000 0f28 0009 16d2 8400 0000 0002 e180 0009 16df 2600 0001 0004 31c0 0009 16ed 8000 0004
2010220 ffff fb05 0009 1701 8000 0004 ffff fb05 0000 0000 a200 0000 0000 0000 0009 1710 8200 0000 0000 1ad7 0009 171a 8400 0000
2010300 0002 e180 0009 1724 2600 0001 0004 3204 0009 1732 8000 0001 ffff fb05 0009 17b4 8000 0004 ffff fb05 0009 17e3 8000 0004
2010360 ffff fb05 0000 0000 a200 0000 0000 0000 0009 1803 8200 0000 0000 d167 0009 1811 8400 0000 0002 e180 0009 181f 2600 0001
2010440 0004 3248 0009 1843 8000 0000 ffff fb05 0009 1875 8000 0000 ffff fb05 0009 18a3 8000 0000 ffff fb05 0009 18db 8000 0000
2010520 ffff fb05 0009 1911 8000 0008 ffff fb05 0009 195c 8000 0194 ffff fb05 0009 19c8 8000 0048 ffff fb05 0009 1aa6 8000 0048
2010600 ffff fb05 0009 1b7b 8000 0048 ffff fb05 0009 1baf 8000 000c ffff fb05 0009 1c0b 2000 0004 0000 0000 0009 1c22 2000 0004
2010660 0000 0000 0009 1c38 2000 0004 0000 0000 0000 0000 a200 0000 0000 0000 0009 1c4f 2800 0048 0004 af28 0009 1c62 8400 0000
2010740 0002 e180 0009 1c6c 2000 0004 0000 0000 0009 1c82 2000 0004 0000 0000 0009 1c9a 2600 0001 0004 32a4 0009 1cb1 2600 0001
2011020 0004 32a8 0009 1cc6 2600 0004 0004 32ac 0009 1cdb 2600 0194 0004 32b0 0009 1ce6 2600 0048 0004 3444 0009 1d02 2600 0048
2011100 0004 348c 0009 1d15 2600 0048 0004 3490 0009 1d28 2600 0004 0004 3494 0009 1d39 2600 0048 0004 3498 0009 1d63 2400 0000
2011160 0002 e180 0009 1d76 a000 0001 0000 0044 0009 1d7f a000 0004 0000 0048 0009 1d8b a000 0001 0000 004c 0000 0000 4400 0043
2011240 0002 e180 0009 1d94 4000 0004 0000 0019 0000 0000 4400 0043 0002 e194 0009 1da0 4000 0001 0000 001d 0009 1dae 8000 0004
2011320 ffff fffc 0000 0000 c000 0002 0000 0014 0000 0000 4400 0047 0002 e194 0000 0000 4400 0049 0002 e198 0000 0000 4400 0049
2011400 0002 e1d4 0000 0000 4400 004b 0002 e1e0 0000 0000 4400 004c 0002 e1ec 0000 0000 4400 004e 0002 e1fc 0000 0000 e000 0002
2011460 0000 00a4 0000 0000 4400 004f 0002 e224 0009 1db9 2400 0004 0002 e22c 0000 0000 4400 0052 0002 e22c 0000 0000 4400 0052
2011540 0002 e238 0000 0000 4400 0053 0002 e238 0000 0000 4400 0054 0002 e258 0009 1dd3 2400 0004 0002 e268 0009 1de8 a000 0001
2011620 0000 0044 0000 0000 4400 0058 0002 e268 0000 0000 4400 0058 0002 e278 0000 0000 4400 0059 0002 e278 0000 0000 4400 005a
2011700 0002 e2c0 0009 1df1 2400 0004 0002 e2d0 0000 0000 4400 005e 0002 e2d0 0000 0000 4400 005e 0002 e2dc 0009 1e07 4000 0048
2011760 0000 001d 0009 1e15 8000 0004 ffff fffc 0000 0000 4400 0060 0002 e2dc 0000 0000 c000 0002 0000 0160 0000 0000 4400 0062
2012040 0002 e2e0 0000 0000 4400 0064 0002 e2f4 0000 0000 4400 0062 0002 e300 0000 0000 4400 0067 0002 e30c 0000 0000 e000 0002
2012120 0000 0198 0000 0000 4400 0068 0002 e318 0009 1e21 2400 0004 0002 e328 0009 1e3f a000 0001 0000 0044 0009 1e49 a000 0004
2012200 0000 0048 0000 0000 4400 006d 0002 e328 0009 1e55 4000 0001 0000 0018 0000 0000 4400 006d 0002 e338 0009 1e5e 4000 000c
2012260 0000 001d 0000 0000 c000 0002 0000 01b8 0000 0000 4400 0070 0002 e338 0000 0000 4400 0071 0002 e344 0000 0000 4400 0074
2012340 0002 e350 0000 0000 4400 0075 0002 e374 0000 0000 4400 0071 0002 e380 0000 0000 4400 0077 0002 e38c 0000 0000 e000 0002
2012420 0000 0218 0000 0000 4400 0078 0002 e398 0009 1e6c 2400 0004 0002 e3a8 0000 0000 4400 007b 0002 e3a8 0000 0000 4400 007b
2012500 0002 e3b4 0000 0000 4400 007c 0002 e3b4 0000 0000 4400 007d 0002 e3d4 0000 0000 4400 007e 0002 e3e4 0009 1e84 2400 0004
2012560 0002 e3f4 0000 0000 4400 0081 0002 e3f4 0000 0000 4400 0081 0002 e400 0000 0000 4400 0082 0002 e400 0000 0000 4400 0083
2012640 0002 e410 0009 1e9c 2400 0000 0002 e420 0001 1eb2 a000 0004 0000 0044 0000 0000 4400 0087 0002 e420 0000 0000 4400 0087
2012720 0002 e430 0000 0000 4400 0088 0002 e430 0000 0000 4400 0089 0002 e450 0000 0000 4400 008a 0002 e45c 0000 0000 4400 008b
2013000 0002 e47c 0000 0000 4400 008c 0002 e488 0009 1ebf 2400 0004 0002 e490 0000 0000 4400 008f 0002 e490 0000 0000 4400 008f
2013060 0002 e49c 0009 1ed3 9000 0048 ffff fffc 0000 0000 c000 0002 0000 031c 0000 0000 4400 0092 0002 e49c 0000 0000 4400 0093
2013140 0002 e4b0 0000 0000 4400 0094 0002 e4bc 0000 0000 4400 0095 0002 e4c8 0000 0000 4400 0096 0002 e4fc 0000 0000 e000 0002
2013220 0000 0388 0000 0000 4400 0097 0002 e508 0009 1edf 2400 0000 0002 e518 0009 1ef6 a000 0004 0000 0044 0009 1f03 a000 0004
2013300 0000 0048 0000 0000 4400 009c 0002 e518 0000 0000 4400 009c 0002 e52c 0009 1f15 8000 0048 ffff fffc 0000 0000 c000 0002
2013360 0000 03ac 0000 0000 4400 009f 0002 e52c 0000 0000 4400 00a0 0002 e544 0000 0000 e000 0002 0000 03d0 0000 0000 4400 00a1
2013440 0002 e550 0009 1f20 2400 0004 0002 e558 0009 1f39 a000 0048 0000 0044 0009 1f48 a000 0004 0000 0048 0009 1f55 a000 0048
2013520 0000 004c 0009 1f63 a000 0004 0000 0050 0000 0000 4400 00a8 0002 e558 0000 0000 4400 00a9 0002 e574 0000 0000 4400 00a9
2013600 0002 e574 0000 0000 4400 00ab 0002 e594 0000 0000 4400 00af 0002 e590 0000 0000 4400 00b1 0002 e5ac 0000 0000 4400 00b3
2013660 0002 e5c8 0000 0000 4400 00b5 0002 e5dc 0000 0000 4400 00b6 0002 e5f0 0000 0000 4400 00b8 0002 e604 0000 0000 4400 00ba
2013740 0002 e618 0000 0000 4400 00bc 0002 e628 0000 0000 4400 00be 0002 e638 0000 0000 4400 00bf 0002 e64c 0000 0000 4400 00c1
2014020 0002 e660 0000 0000 4400 00c2 0002 e678 0000 0000 4400 00c3 0002 e68c 0000 0000 4400 00c7 0002 e6a4 0000 0000 4400 00c8
2014100 0002 e6b0 0000 0000 4400 00cb 0002 e6bc 0000 0000 4400 00cc 0002 e6c8 0000 0000 4400 00cd 0002 e6d8 0000 0000 4400 00ce
2014160 0002 e6e4 0000 0000 4400 00cf 0002 e6f0 0000 0000 4400 00d0 0002 e6fc 0000 0000 4400 00d1 0002 e708 0000 0000 4400 00d2
```

```
2014240  0002 e714 0000 0000 4400 00d4 0002 e728 0000 0000 4400 00d5 0002 e738 0000 0000 4400 00d7 0002 e750 0000 0000 4400 00d8
2014320  0002 e760 0009 1f7c 2400 0000 0002 e770 0000 0000 4400 00db 0002 e770 0000 0000 4400 00db 0002 e77c 0000 0000 4400 00dc
2014400  0002 e77c 0000 0000 4400 00dd 0002 e78c 0000 0000 4400 00de 0002 e794 0009 1f92 2400 0004 0002 e79c 0009 1fa7 a000 0004
2014460  0000 0044 0000 0000 4400 00e2 0002 e79c 0000 0000 4400 00e2 0002 e7ac 0000 0000 4400 00e4 0002 e7ac 0000 0000 4400 00e5
2014540  0002 e7b8 0000 0000 4400 00e7 0002 e7d0 0000 0000 4400 00e9 0002 e7dc 0000 0000 4400 00eb 0002 e7ec 0000 0000 4400 00ec
2014620  0002 e7fc 0000 0000 4400 00ee 0002 e808 0009 1fb4 2400 0004 0002 e818 0009 1fcd a000 0048 0000 0044 0000 0000 4400 00f3
2014700  0002 e818 0000 0000 4400 00f3 0002 e828 0009 1fdb 8000 000c ffff fffc 0009 1fe8 8000 000c ffff fff8 0000 0000 c000 0002
2014760  0000 06a8 0000 0000 4400 00f6 0002 e828 0000 0000 4400 00f8 0002 e844 0000 0000 4400 00f9 0002 e84c 0000 0000 4400 00fa
2015040  0002 e858 0000 0000 4400 00fb 0002 e86c 0000 0000 4400 00f6 0002 e878 0000 0000 e000 0002 0000 0700 0000 0000 4400 00fd
2015120  0002 e880 0009 1ff4 2400 0004 0002 e890 0009 2018 a000 0048 0000 0044 0000 0000 4400 0101 0002 e890 0000 0000 4400 0101
2015200  0002 e8a0 0009 2026 8000 0048 ffff fffc 0000 0000 c000 0002 0000 0720 0000 0000 4400 0105 0002 e8a0 0000 0000 4400 0108
2015260  0002 e8c0 0000 0000 4400 010a 0002 e8d8 0000 0000 4400 010b 0002 e8e8 0000 0000 4400 0105 0002 e8f0 0000 0000 4400 010f
2015340  0002 e908 0000 0000 e000 0002 0000 07a8 0000 0000 4400 0110 0002 e928 0009 2034 2400 0001 0002 e938 0009 2045 a000 0004
2015420  0000 0044 0000 0000 4400 0114 0002 e938 0009 2051 4000 0004 0000 0018 0000 0000 4400 0114 0002 e944 0009 205d 8000 0001
2015500  ffff fffc 0009 2065 4000 0004 0000 001d 0000 0000 c000 0002 0000 07c4 0000 0000 4400 0118 0002 e944 0000 0000 4400 0119
2015560  0002 e95c 0000 0000 4400 011a 0002 e968 0000 0000 4400 011b 0002 e98c 0000 0000 4400 011e 0002 e990 0000 0000 4400 011f
2015640  0002 e994 0000 0000 4400 0120 0002 e9a0 0000 0000 4400 0121 0002 e9b0 0000 0000 4400 0128 0002 e9c4 0000 0000 e000 0002
2015720  0000 0850 0000 0000 4400 0129 0002 e9d0 0009 2077 2400 0001 0002 e9e0 0009 2087 a000 0004 0000 0044 0000 0000 4400 012e
2016000  0002 e9e0 0000 0000 4400 012e 0002 e9f0 0000 0000 4400 012f 0002 e9f0 0000 0000 4400 0130 0002 ea0c 0000 0000 4400 0131
2016060  0002 ea3c 0009 2093 2400 0000 0002 ea4c 0009 20a3 a000 0001 0000 0044 0000 0000 4400 0136 0002 ea4c 0000 0000 4400 0136
2016140  0002 ea5c 0000 0000 4400 0137 0002 ea5c 0000 0000 4400 013a 0002 ea6c 0000 0000 4400 013c 0002 eaa0 0000 0000 4400 013f
2016220  0002 eab0 0000 0000 4400 0141 0002 ead0 0009 20ac 2400 0001 0002 ead8 0009 20c3 a000 0004 0000 0044 0000 0000 4400 0146
2016300  0002 ead8 0000 0000 4400 0146 0002 eae8 0009 20cf 8000 0001 ffff fffc 0009 20d9 8000 0001 ffff fff8 0000 0000 c000 0002
2016360  0000 0968 0000 0000 4400 0149 0002 eae8 0000 0000 4400 014b 0002 eaf8 0000 0000 4400 014d 0002 eb08 0000 0000 4400 014e
2016440  0002 eb10 0000 0000 4400 014f 0002 eb20 0000 0000 4400 0150 0002 eb34 0000 0000 4400 0152 0002 eb4c 0000 0000 4400 0155
2016520  0002 eb60 0000 0000 4400 0156 0002 eb74 0000 0000 4400 0158 0002 eb88 0000 0000 4400 015a 0002 eba0 0000 0000 4400 015c
2016600  0002 ebb4 0000 0000 4400 015e 0002 ebe0 0000 0000 4400 0161 0002 ebec 0000 0000 4400 0163 0002 ec18 0000 0000 4400 0166
2016660  0002 ec24 0000 0000 e000 0002 0000 0ab0 0000 0000 4400 0167 0002 ec30 0009 20e3 2400 0004 0002 ec40 0009 20f7 a000 0001
2016740  0000 0044 0009 2102 a000 0004 0000 0048 0000 0000 4400 016c 0002 ec40 0000 0000 4400 016c 0002 ec54 0000 0000 4400 016d
2017020  0002 ec54 0000 0000 4400 016e 0002 ec68 0000 0000 4400 016f 0002 ec7c 0009 210e 2400 0000 0002 ec8c 0000 0000 4400 0172
2017100  0002 ec8c 0000 0000 4400 0172 0002 ec98 0000 0000 4400 0173 0002 ec98 0000 0000 4400 0174 0002 eca4 0000 0000 4400 0175
2017160  0002 ecc0 0009 2126 2400 0000 0002 ecc8 0000 0000 4400 0178 0002 ecc8 0000 0000 4400 0178 0002 ecd4 0000 0000 4400 0179
2017240  0002 ecd4 0000 0000 4400 017a 0002 ece0 0000 0000 4400 017b 0002 ecfc 0009 213d 2400 0000 0002 ed04 0000 0000 4400 017e
2017320  0002 ed04 0000 0000 4400 017e 0002 ed10 0000 0000 4400 017f 0002 ed10 0000 0000 4400 0180 0002 ed18 0000 0000 4400 0181
2017400  0002 ed20 0009 214f 2400 0004 0002 ed28 0000 0000 4400 0184 0002 ed28 0000 0000 4400 0184 0002 ed34 0009 2169 8000 0004
2017460  ffff fffc 0009 2171 8000 0048 ffff fff8 0000 0000 c000 0002 0000 0bb4 0000 0000 4400 0188 0002 ed34 0000 0000 4400 0189
2017540  0002 ed44 0000 0000 4400 018b 0002 ed60 0000 0000 4400 018c 0002 ed78 0000 0000 4400 0189 0002 ed84 0000 0000 e000 0002
2017620  0000 0c18 0000 0000 4400 018e 0002 ed98 0009 217e 2400 0004 0002 eda8 0009 219e a000 0048 0000 0044 0000 0000 4400 0192
2017700  0002 eda8 0000 0000 4400 0192 0002 edb8 0000 0000 4400 0193 0002 edb8 0000 0000 4400 0194 0002 edd0 0000 0000 4400 0195
2017760  0002 eddc 0009 21ac 2400 0004 0002 edec 0009 21ca a000 0048 0000 0044 0000 0000 4400 0199 0002 edec 0000 0000 4400 0199
2020040  0002 edfc 0009 21d8 8000 0048 ffff fffc 0000 0000 c000 0002 0000 0c7c 0000 0000 4400 019c 0002 edfc 0000 0000 4400 019d
2020120  0002 ee18 0000 0000 4400 019e 0002 ee2c 0000 0000 4400 019c 0002 ee38 0000 0000 4400 019f 0002 ee4c 0000 0000 e000 0002
2020200  0000 0cd8 0000 0000 4400 01a0 0002 ee58 0009 21e1 2400 0004 0002 ee68 0000 0000 4400 01a3 0002 ee68 0000 0000 4400 01a3
2020260  0002 ee74 0009 21fa 8000 0048 ffff fffc 0000 0000 c000 0002 0000 0cf4 0000 0000 4400 01a6 0002 ee74 0000 0000 4400 01a7
2020340  0002 ee90 0000 0000 4400 01a6 0002 ee9c 0000 0000 e000 0002 0000 0d30 0000 0000 4400 01a8 0002 eeb0 0009 2207 2400 0004
2020420  0002 eec0 0009 221a a000 0004 0000 0044 0000 0000 4400 01ac 0002 eec0 0000 0000 4400 01ac 0002 eed0 0000 0000 4400 01ae
2020500  0002 eed0 0000 0000 4400 01af 0002 ef20 0009 2227 2400 0000 0002 ef30 0009 223f a000 0004 0000 0044 0000 0000 4400 01b3
2020560  0002 ef30 0000 0000 4400 01b3 0002 ef40 0000 0000 4400 01b4 0002 ef40 0000 0000 4400 01b5 0002 ef58 0000 0000 4400 01b6
2020640  0002 ef64 0000 0000 4400 01b7 0002 ef80 0000 0000 4400 01b8 0002 ef8c 0000 0000 4400 01b9 0002 efa8 0000 0000 4400 01ba
2020720  0002 efb4 0000 0000 4400 01bb 0002 efc8 0009 224c 2400 0004 0002 efd0 0009 2260 a000 0048 0000 0044 0000 0000 4400 01bf
2021000  0002 efd0 0000 0000 4400 01bf 0002 efe0 0000 0000 4400 01c0 0002 efe0 0000 0000 4400 01c1 0002 effc 0000 0000 4400 01c2
2021060  0002 f008 0000 0000 4400 01c3 0002 f024 0000 0000 4400 01c4 0002 f030 0000 0000 4400 01c5 0002 f044 0009 226e 2400 0004
2021140  0002 f054 0009 228e a000 0004 0000 0044 0000 0000 4400 01ca 0002 f054 0000 0000 4400 01ca 0002 f064 0000 0000 4400 01cb
2021220  0002 f064 0000 0000 4400 01cc 0002 f09c 0000 0000 4400 01cd 0002 f0ac 0009 229b 2400 0004 0002 f0bc 0009 22b4 a000 0004
2021300  0000 0044 0000 0000 4400 01d3 0002 f0bc 0000 0000 4400 01d3 0002 f0cc 0000 0000 4400 01d4 0002 f0cc 0000 0000 4400 01d5
```

```
2021360 0002 f0dc 0000 0000 4400 01d8 0002 f0ec 0000 0000 4400 01d9 0002 f124 0000 0000 4400 01db 0002 f134 0009 22c1 2400 0004
2021440 0002 f144 0009 22cf a000 0004 0000 0044 0000 0000 4400 01e0 0002 f144 0000 0000 4400 01e0 0002 f154 0009 22df 8000 0048
2021520 ffff fffc 0009 22e8 8000 0004 ffff fff8 0000 0000 c000 0002 0000 0fd4 0000 0000 4400 01e4 0002 f154 0000 0000 4400 01e5
2021600 0002 f158 0000 0000 4400 01e6 0002 f168 0000 0000 4400 01e8 0002 f178 0000 0000 4400 01e9 0002 f194 0000 0000 4400 01eb
2021660 0002 f1ac 0000 0000 e000 0002 0000 1038 0000 0000 4400 01ec 0002 f1b8 0009 22f2 2400 0004 0002 f1c8 0009 230c a000 0001
2021740 0000 0044 0009 2316 a000 0001 0000 0048 0000 0000 4400 01ff 0002 f1c8 0000 0000 4400 01ff 0002 f1dc 0000 0000 4400 0200
2022020 0002 f1dc 0000 0000 4400 0201 0002 f1f0 0009 2320 2400 0004 0002 f200 0009 2337 a000 0001 0000 0044 0000 0000 4400 020e
2022100 0002 f200 0000 0000 4400 020e 0002 f210 0009 2340 4000 0004 0000 001d 0000 0000 c000 0002 0000 1090 0000 0000 4400 0211
2022160 0002 f210 0000 0000 4400 0213 0002 f21c 0000 0000 4400 0214 0002 f224 0000 0000 4400 0215 0002 f22c 0000 0000 4400 0216
2022240 0002 f234 0000 0000 4400 0217 0002 f23c 0000 0000 4400 0218 0002 f244 0000 0000 4400 0219 0002 f24c 0000 0000 4400 021a
2022320 0002 f254 0000 0000 4400 021b 0002 f25c 0000 0000 4400 021c 0002 f264 0000 0000 4400 021e 0002 f26c 0000 0000 e000 0002
2022400 0000 10f8 0000 0000 4400 021f 0002 f278 0009 234b 2400 0000 0002 f288 0009 2366 a000 0004 0000 0044 0009 237a a000 0001
2022460 0000 0048 0000 0000 4400 022c 0002 f288 0000 0000 4400 022c 0002 f29c 0009 2388 8000 0004 ffff fffc 0009 2395 8000 0001
2022540 ffff fff8 0009 23a0 8000 0048 ffff fff4 0000 0000 c000 0002 0000 111c 0000 0000 4400 0231 0002 f29c 0000 0000 4400 0233
2022620 0002 f2a4 0000 0000 4400 0236 0002 f2e8 0000 0000 4400 0237 0002 f2f4 0000 0000 4400 0238 0002 f310 0000 0000 4400 023a
2022700 0002 f318 0000 0000 4400 023c 0002 f324 0000 0000 e000 0002 0000 11e4 0000 0000 4400 023e 0002 f364 0009 23ad 2400 0001
2022760 0002 f36c 0009 23c8 a000 0004 0000 0044 0000 0000 4400 0249 0002 f36c 0000 0000 4400 0249 0002 f37c 0000 0000 4400 024a
2023040 0002 f37c 0000 0000 4400 024b 0002 f38c 0009 23d5 2400 0000 0002 f39c 0000 0000 4400 0256 0002 f39c 0000 0000 4400 0256
2023120 0002 f3a8 0000 0000 4400 0257 0002 f3a8 0000 0000 4400 0258 0002 f3b4 0009 23f3 2400 0000 0002 f3bc 0000 0000 4400 0261
2023200 0002 f3bc 0000 0000 4400 0261 0002 f3c8 0000 0000 4400 0262 0002 f3c8 0000 0000 4400 0263 0002 f3d0 0009 2412 0400 0000
2023260 0002 f3d8 0009 2419 0400 0000 0002 f558 0009 242a 0400 0000 0002 f634 0009 2434 0600 0000 0004 73cc 0009 243b 0600 0000
2023340 0004 7410 0009 2442 0600 0000 0004 7388 0009 2449 0600 0000 0004 7454 0009 2454 0600 0000 0004 7340 0009 245c 6400 0000
2023420 0002 f3d8 0009 2479 6400 0000 0002 f3d8 0009 2485 8000 0000 0000 0000 0009 24af 8000 0000 0000 0000 0009 24c9 8000 0000
2023500 0000 0000 0009 24f4 8000 0000 0000 0000 0009 2516 8000 0000 0000 0000 0009 2539 8000 0000 0000 0000 0009 255f 8000 0000
2023560 0000 0000 0009 2581 8000 0000 0000 0000 0009 25a2 8000 0000 0000 0000 0009 25bb 8000 0000 0000 0000 0009 25d6 8000 0000
2023640 0000 0000 0009 25ea 8000 0000 0000 0000 0009 25fc 2600 0001 0004 7340 0009 261e 8200 0000 0000 078d 0009 262b 8400 0000
2023720 0002 f3d8 0009 2638 2600 0001 0004 7388 0000 0000 a200 0000 0000 0000 0009 2658 8200 0000 0000 0f28 0009 2665 8400 0000
2024000 0002 f3d8 0009 2672 2600 0001 0004 73cc 0009 267f 8000 0004 ffff fb05 0009 2693 8000 0004 ffff fb05 0000 0000 a200 0000
2024060 0000 0000 0009 26a2 8200 0000 0000 1ad7 0009 26ac 8400 0000 0002 f3d8 0009 26b6 2600 0001 0004 7410 0009 26c3 8000 0001
2024140 ffff fb05 0009 2745 8000 0004 ffff fb05 0009 2774 8900 0004 ffff fb05 0000 0000 a200 0000 0000 0000 0009 2794 8200 0000
2024220 0000 d167 0009 27a2 8400 0000 0002 f3d8 0009 27b0 2600 0001 0004 7454 0009 27d4 8000 0000 ffff fb05 0009 2806 8000 0000
2024300 ffff fb05 0009 2934 8000 0000 ffff fb05 0009 286c 8000 0000 ffff fb05 0009 28a2 8000 0008 ffff fb05 0009 28ed 8000 0194
2024360 ffff fb05 0009 2959 8000 0048 ffff fb05 0009 2a37 8000 0048 ffff fb05 0009 2b0c 8000 0048 ffff fb05 0009 2b40 8000 000c
2024440 ffff fb05 0009 2b9c 2000 0004 0000 0000 0009 2bb3 2000 0004 0000 0000 0009 2bc9 2000 0004 0000 0000 0000 0000 a200 0000
2024520 0000 0000 0009 2be0 8000 0000 ffff fb05 0009 2c0c 8000 000c ffff fb05 0009 2c70 2400 0000 0002 f3d8 0009 2c98 a000 0048
2024600 0000 0044 0009 2ca6 8400 0000 0002 f3d8 0000 0000 4400 0019 0002 f3d8 0000 0000 4400 0019 0002 f3e8 0000 0000 c000 0002
2024660 0000 0010 0000 0000 4400 001e 0002 f3e8 0000 0000 4400 001f 0002 f3f8 0000 0000 4400 0020 0002 f408 0000 0000 e000 0002
2024740 0000 0040 0000 0000 4400 0021 0002 f418 0009 2cb2 2400 0001 0002 f420 0009 2cc4 a000 0004 0000 0044 0009 2cd0 a000 0048
2025020 0000 0048 0000 0000 4400 0026 0002 f420 0009 2cde 4000 0004 0000 0018 0009 2cea 4000 0048 0000 0019 0000 0000 4400 0026
2025100 0002 f42c 0009 2cf8 8000 0004 ffff fffc 0009 2d07 8000 0001 ffff fff8 0000 0000 c000 0002 0000 0054 0000 0000 4400 002a
2025160 0002 f42c 0000 0000 4400 002c 0002 f440 0000 0000 4400 002e 0002 f454 0000 0000 4400 002f 0002 f458 0000 0000 4400 0032
2025240 0002 f45c 0000 0000 4400 0033 0002 f470 0000 0000 4400 0035 0002 f480 0000 0000 4400 0036 0002 f488 0000 0000 4400 0037
2025320 0002 f498 0000 0000 4400 0039 0002 f4a4 0000 0000 4400 003a 0002 f4b0 0000 0000 4400 003c 0002 f4c4 0000 0000 4400 0041
2025400 0002 f4e8 0000 0000 4400 0042 0002 f4fc 0000 0000 4400 0044 0002 f50c 0000 0000 4400 0045 0002 f514 0000 0000 4400 0046
2025460 0002 f524 0000 0000 4400 0047 0002 f530 0000 0000 4400 0049 0002 f53c 0000 0000 e000 0002 0000 0170 0000 0000 4400 004a
2025540 0002 f548 0009 2d11 2400 0004 0002 f558 0009 2d28 a000 0004 0000 0044 0009 2d34 a000 0048 0000 0048 0000 0000 4400 004f
2025620 0002 f558 0000 0000 4400 004f 0002 f56c 0009 2d42 8000 000c ffff fffc 0009 2d4f 8000 0004 ffff fff8 0009 2d61 8000 0004
2025700 ffff fff4 0000 0000 c000 0002 0000 0194 0000 0000 4400 0053 0002 f56c 0000 0000 4400 0054 0002 f5a0 0000 0000 4400 0055
2025760 0002 f5ac 0000 0000 4400 0056 0002 f5bc 0000 0000 4400 0057 0002 f5cc 0000 0000 4400 0058 0002 f5d8 0000 0000 4400 0059
2026040 0002 f5e4 0000 0000 4400 005a 0002 f5f0 0000 0000 e000 0002 0000 0228 0000 0000 4400 005b 0002 f600 0009 2175 2400 0001
2026120 0002 f610 0009 2d86 a000 0001 0000 0044 0009 2d9f a000 0048 0000 0048 0000 0000 4400 0061 0002 f610 0000 0000 4400 0061
2026200 0002 f624 0000 0000 4400 0062 0002 f624 0009 2d9d 2400 0004 0002 f634 0009 2dad a000 000c 0000 0044 0009 2db9 a000 0048
2026260 0000 0048 0000 0000 4400 0067 0002 f634 0000 0000 4400 0067 0002 f648 0000 0000 4400 0068 0002 f648 0000 0000 4400 0069
2026340 0002 f658 0000 0000 4400 006b 0002 f668 0000 0000 4400 006c 0002 f678 0000 0000 4400 006d 0002 f684 0009 2dc7 2400 0001
2026420 0002 f694 0009 2de0 a000 0048 0000 0044 0000 0000 4400 0071 0002 f694 0000 0000 4400 0071 0002 f6a4 0009 2dee 8000 000c
```

| | | | | | | | | | | | | | | | | | | | | | | | | |
|---|---|---|---|---|---|---|---|---|---|---|---|---|---|---|---|---|---|---|---|---|---|---|---|---|
| 2026500 | ffff | fffc | 0000 | 0000 | c000 | 0002 | 0000 | 02cc | 0000 | 0000 | 4400 | 0074 | 0002 | f6a4 | 0000 | 0000 | 4400 | 0076 | 0002 | f6b8 | 0000 | 0000 | 4400 | 0078 |
| 2026560 | 0002 | f6d4 | 0000 | 0000 | 4400 | 007a | 0002 | f6f0 | 0000 | 0000 | 4400 | 007c | 0002 | f6fc | 0000 | 0000 | 4400 | 007d | 0002 | f718 | 0000 | 0000 | 4400 | 0076 |
| 2026640 | 0002 | f724 | 0000 | 0000 | e000 | 0002 | 0000 | 0360 | 0000 | 0000 | 4400 | 0080 | 0002 | f738 | 0009 | 2df9 | 0400 | 0000 | 0002 | f748 | 0009 | 2e00 | 0400 | 0000 |
| 2026720 | 0003 | 0158 | 0009 | 2e1e | 0400 | 0000 | 0002 | feac | 0009 | 2e36 | 0400 | 0000 | 0002 | fc40 | 0009 | 2e47 | 0400 | 0000 | 0003 | 02bc | 0009 | 2e5e | 0400 | 0000 |
| 2027000 | 0002 | fa80 | 0009 | 2e7a | 0600 | 0000 | 0004 | 752c | 0009 | 2e81 | 0400 | 0000 | 0002 | feec | 0009 | 2e8b | 0600 | 0000 | 0004 | 7570 | 0009 | 2e92 | 0600 | 0000 |
| 2027060 | 0004 | 74e8 | 0009 | 2e99 | 0400 | 0000 | 0003 | 025c | 0009 | 2eb5 | 0400 | 0000 | 0002 | fbb0 | 0009 | 2ec3 | 0600 | 0000 | 0004 | 75b4 | 0009 | 2ece | 0400 | 0000 |
| 2027140 | 0002 | ff84 | 0009 | 2eda | 0400 | 0000 | 0002 | f900 | 0009 | 2eea | 0400 | 0000 | 0003 | 01c0 | 0009 | 2f03 | 0400 | 0000 | 0002 | fa1c | 0009 | 2f21 | 0400 | 0000 |
| 2027220 | 0003 | 00c8 | 0009 | 2f33 | 0400 | 0000 | 0002 | fb60 | 0009 | 2f43 | 0400 | 0000 | 0002 | fe30 | 0009 | 2f65 | 0600 | 0000 | 0004 | 74a0 | 0009 | 2f6d | 0400 | 0000 |
| 2027300 | 0002 | f7a4 | 0009 | 2f7d | 6400 | 0000 | 0002 | f748 | 0009 | 2f9a | 6400 | 0000 | 0002 | f748 | 0009 | 2fa6 | 8000 | 0000 | 0000 | 0000 | 0009 | 2fd0 | 8000 | 0000 |
| 2027360 | 0000 | 0000 | 0009 | 2fea | 8000 | 0000 | 0000 | 0000 | 0009 | 3015 | 8000 | 0000 | 0000 | 0000 | 0009 | 3037 | 8000 | 0000 | 0000 | 0000 | 0009 | 305a | 8000 | 0000 |
| 2027440 | 0000 | 0000 | 0009 | 3080 | 8000 | 0000 | 0000 | 0000 | 0009 | 30a2 | 8000 | 0000 | 0000 | 0000 | 0009 | 30c3 | 8000 | 0000 | 0000 | 0000 | 0009 | 30dc | 8000 | 0000 |
| 2027520 | 0000 | 0000 | 0009 | 30f7 | 8000 | 0000 | 0000 | 0000 | 0009 | 310b | 8000 | 0000 | 0000 | 0000 | 0009 | 311d | 2600 | 0001 | 0004 | 74a0 | 0009 | 313f | 8200 | 0000 |
| 2027600 | 0000 | 078d | 0009 | 314c | 8400 | 0000 | 0002 | f748 | 0009 | 3159 | 2600 | 0001 | 0004 | 74e8 | 0000 | 0000 | a200 | 0000 | 0000 | 0000 | 0009 | 3179 | 8200 | 0000 |
| 2027660 | 0000 | 0f28 | 0009 | 3186 | 8400 | 0000 | 0002 | f748 | 0009 | 3193 | 2600 | 0001 | 0004 | 752c | 0009 | 31a0 | 8000 | 0004 | ffff | fb05 | 0009 | 31b4 | 8000 | 0004 |
| 2027740 | ffff | fb05 | 0000 | 0000 | a200 | 0000 | 0000 | 0000 | 0009 | 31c3 | 8200 | 0000 | 0000 | 1ad7 | 0009 | 31cd | 8400 | 0000 | 0002 | f748 | 0009 | 31d7 | 2600 | 0001 |
| 2030020 | 0004 | 7570 | 0009 | 31e4 | 8000 | 0001 | ffff | fb05 | 0009 | 3266 | 8000 | 0004 | ffff | fb05 | 0009 | 3295 | 8000 | 0004 | ffff | fb05 | 0000 | 0000 | a200 | 0000 |
| 2030100 | 0000 | 0000 | 0009 | 32b5 | 8200 | 0000 | 0000 | d167 | 0009 | 32c3 | 8400 | 0001 | 0002 | f748 | 0009 | 32d1 | 2600 | 0001 | 0004 | 75b4 | 0009 | 32f5 | 8000 | 0000 |
| 2030160 | ffff | fb05 | 0009 | 3327 | 8000 | 0000 | ffff | fb05 | 0009 | 3355 | 8000 | 0000 | ffff | fb05 | 0009 | 338d | 8000 | 0000 | ffff | fb05 | 0009 | 33c3 | 8000 | 0008 |
| 2030240 | ffff | fb05 | 0009 | 340e | 8000 | 0194 | ffff | fb05 | 0009 | 347a | 8000 | 0048 | ffff | fb05 | 0009 | 3558 | 8000 | 0048 | ffff | fb05 | 0009 | 362d | 8000 | 0048 |
| 2030320 | ffff | fb05 | 0009 | 3661 | 8000 | 000c | ffff | fb05 | 0009 | 36bd | 2000 | 0004 | 0000 | 0000 | 0009 | 36d4 | 2000 | 0004 | 0000 | 0000 | 0009 | 36ea | 2000 | 0004 |
| 2030400 | 0000 | 0000 | 0000 | 0000 | a200 | 0000 | 0000 | 0000 | 0009 | 3701 | 8000 | 0000 | ffff | fb05 | 0009 | 372d | 8000 | 0010 | ffff | fb05 | 0009 | 37ac | 8000 | 0000 |
| 2030460 | ffff | fb05 | 0009 | 37f0 | 8000 | 0008 | ffff | fb05 | 0009 | 383b | 2400 | 0000 | 0002 | f748 | 0009 | 3868 | a000 | 0048 | 0000 | 0044 | 0009 | 3876 | 8400 | 0000 |
| 2030540 | 0002 | f748 | 0000 | 0000 | 4400 | 0022 | 0002 | f748 | 0000 | 0000 | 4400 | 0022 | 0002 | f758 | 0000 | 0000 | 4400 | 0023 | 0002 | f758 | 0000 | 0000 | 4400 | 0024 |
| 2030620 | 0002 | f768 | 0000 | 0000 | 4400 | 0025 | 0002 | f778 | 0000 | 0000 | 4400 | 0027 | 0002 | f788 | 0000 | 0000 | 4400 | 0028 | 0002 | f79c | 0009 | 3882 | 2400 | 0004 |
| 2030700 | 0002 | f7a4 | 0009 | 3898 | a000 | 0194 | 0000 | 0044 | 0009 | 38b3 | a000 | 0048 | 0000 | 0048 | 0000 | 0000 | 4400 | 002d | 0002 | f7a4 | 0000 | 0000 | 4400 | 002d |
| 2030760 | 0002 | f7b8 | 0000 | 0000 | 4400 | 002f | 0002 | f7b8 | 0000 | 0000 | 4400 | 0032 | 0002 | f7cc | 0000 | 0000 | 4400 | 0033 | 0002 | f7e4 | 0009 | 38c1 | 2400 | 0001 |
| 2031040 | 0002 | f7f4 | 0009 | 38d3 | a000 | 0004 | 0000 | 0044 | 0009 | 38df | a000 | 0048 | 0000 | 0048 | 0000 | 0000 | 4400 | 003a | 0002 | f7f4 | 0000 | 0000 | 4400 | 003a |
| 2031120 | 0002 | f808 | 0009 | 38ed | 8000 | 0004 | ffff | fffc | 0009 | 38fc | 8000 | 0004 | ffff | fff8 | 0009 | 390d | 4000 | 0008 | 0000 | 001d | 0009 | 392d | 8000 | 0001 |
| 2031200 | ffff | fff4 | 0000 | 0000 | c000 | 0002 | 0000 | 00c0 | 0000 | 0000 | 4400 | 0040 | 0002 | f808 | 0000 | 0000 | 4400 | 0042 | 0002 | f81c | 0000 | 0000 | 4400 | 0044 |
| 2031260 | 0002 | f830 | 0000 | 0000 | 4400 | 0045 | 0002 | f838 | 0000 | 0000 | 4400 | 0047 | 0002 | f844 | 0000 | 0000 | 4400 | 0048 | 0002 | f858 | 0000 | 0000 | 4400 | 004b |
| 2031340 | 0002 | f860 | 0000 | 0000 | 4400 | 004d | 0002 | f86c | 0000 | 0000 | 4400 | 004f | 0002 | f888 | 0000 | 0000 | 4400 | 0053 | 0002 | f8a4 | 0000 | 0000 | 4400 | 0054 |
| 2031420 | 0002 | f8b8 | 0000 | 0000 | 4400 | 0055 | 0002 | f8c0 | 0000 | 0000 | 4400 | 0057 | 0002 | f8d4 | 0000 | 0000 | 4400 | 0059 | 0002 | f8e8 | 0000 | 0000 | 4400 | 005a |
| 2031500 | 0002 | f8fc | 0000 | 0000 | 4400 | 005c | 0002 | f918 | 0000 | 0000 | 4400 | 0061 | 0002 | f934 | 0000 | 0000 | 4400 | 0062 | 0002 | f948 | 0000 | 0000 | 4400 | 0063 |
| 2031560 | 0002 | f950 | 0000 | 0000 | 4400 | 0065 | 0002 | f964 | 0000 | 0000 | e000 | 0002 | 0000 | 0228 | 0000 | 0000 | 4400 | 0066 | 0002 | f970 | 0009 | 3937 | 2400 | 0008 |
| 2031640 | 0002 | f980 | 0009 | 394e | a000 | 0004 | 0000 | 0044 | 0009 | 395a | a000 | 0048 | 0000 | 0048 | 0000 | 0000 | 4400 | 006b | 0002 | f980 | 0000 | 0000 | 4400 | 006b |
| 2031720 | 0002 | f994 | 0009 | 3968 | 8000 | 0008 | ffff | fffc | 0000 | 0000 | c000 | 0002 | 0000 | 024c | 0000 | 0000 | 4400 | 0070 | 0002 | f994 | 0000 | 0000 | 4400 | 0072 |
| 2032000 | 0002 | f9a4 | 0000 | 0000 | 4400 | 0075 | 0002 | f9c4 | 0000 | 0000 | 4400 | 0077 | 0002 | f9dc | 0000 | 0000 | 4400 | 0078 | 0002 | f9ec | 0000 | 0000 | 4400 | 007a |
| 2032060 | 0002 | fa00 | 0000 | 0000 | e000 | 0002 | 0000 | 02c4 | 0000 | 0000 | 4400 | 007b | 0002 | fa0c | 0009 | 397f | 2400 | 0008 | 0002 | fa1c | 0009 | 39a4 | a000 | 0004 |
| 2032140 | 0000 | 0044 | 0009 | 39b0 | a000 | 0194 | 0000 | 0048 | 0000 | 0000 | 4400 | 0081 | 0002 | fa1c | 0000 | 0000 | 4400 | 0081 | 0002 | fa30 | 0009 | 39c2 | 4000 | 0008 |
| 2032220 | 0000 | 001d | 0009 | 39de | 4000 | 0008 | 0000 | 001c | 0000 | 0000 | c000 | 0002 | 0000 | 02e8 | 0000 | 0000 | 4400 | 0084 | 0002 | fa30 | 0000 | 0000 | 4400 | 0085 |
| 2032300 | 0002 | fa4c | 0000 | 0000 | 4400 | 0086 | 0002 | fa50 | 0000 | 0000 | 4400 | 0087 | 0002 | fa5c | 0000 | 0000 | 4400 | 0088 | 0002 | fa64 | 0000 | 0000 | e000 | 0002 |
| 2032360 | 0000 | 0328 | 0000 | 0000 | 4400 | 0089 | 0002 | fa70 | 0009 | 39f1 | 2400 | 0008 | 0002 | fa80 | 0009 | 3a14 | a000 | 0004 | 0000 | 0044 | 0009 | 3a20 | a000 | 0194 |
| 2032440 | 0000 | 0048 | 0000 | 0000 | 4400 | 008f | 0002 | fa80 | 0009 | 3a32 | 4000 | 0004 | 0000 | 0018 | 0000 | 0000 | 4400 | 008f | 0002 | fa90 | 0009 | 3a3e | 8000 | 0008 |
| 2032520 | ffff | fff8 | 0009 | 3a4b | 4000 | 0008 | 0000 | 001d | 0009 | 3a5e | 4000 | 0008 | 0000 | 001c | 0009 | 3a71 | 8000 | 0008 | ffff | fff4 | 0009 | 3a84 | 8000 | 0008 |
| 2032600 | ffff | fff0 | 0009 | 3a9b | 4000 | 0004 | 0000 | 001b | 0009 | 3aac | 4000 | 0004 | 0000 | 001a | 0000 | 0000 | c000 | 0002 | 0000 | 0348 | 0000 | 0000 | 4400 | 0095 |
| 2032660 | 0002 | fa90 | 0000 | 0000 | 4400 | 0096 | 0002 | fa94 | 0000 | 0000 | 4400 | 0097 | 0002 | faa0 | 0000 | 0000 | 4400 | 0098 | 0002 | faa8 | 0000 | 0000 | 4400 | 0099 |
| 2032740 | 0002 | faac | 0000 | 0000 | 4400 | 009a | 0002 | fab4 | 0000 | 0000 | 4400 | 009c | 0002 | fac4 | 0000 | 0000 | 4400 | 009d | 0002 | fac8 | 0000 | 0000 | 4400 | 009f |
| 2033020 | 0002 | fae4 | 0000 | 0000 | 4400 | 00a0 | 0002 | fae8 | 0000 | 0000 | 4400 | 00a1 | 0002 | faec | 0000 | 0000 | 4400 | 00a2 | 0002 | faf8 | 0000 | 0000 | 4400 | 00a3 |
| 2033100 | 0002 | fb04 | 0000 | 0000 | 4400 | 00a5 | 0002 | fb0c | 0000 | 0000 | 4400 | 00a7 | 0002 | fb18 | 0000 | 0000 | 4400 | 00a9 | 0002 | fb28 | 0000 | 0000 | 4400 | 00aa |
| 2033160 | 0002 | fb38 | 0000 | 0000 | 4400 | 00ac | 0002 | fb44 | 0000 | 0000 | e000 | 0002 | 0000 | 0408 | 0000 | 0000 | 4400 | 00ad | 0002 | fb50 | 0009 | 3abe | 2400 | 0004 |
| 2033240 | 0002 | fb60 | 0009 | 3ad4 | a000 | 0008 | 0000 | 0044 | 0009 | 3af5 | a000 | 0004 | 0000 | 0048 | 0009 | 3b01 | a000 | 0048 | 0000 | 004c | 0000 | 0000 | 4400 | 00b6 |
| 2033320 | 0002 | fb60 | 0000 | 0000 | 4400 | 00b6 | 0002 | fb78 | 0000 | 0000 | 4400 | 00b8 | 0002 | fb78 | 0000 | 0000 | 4400 | 00ba | 0002 | fb90 | 0000 | 0000 | 4400 | 00bb |
| 2033400 | 0002 | fba0 | 0009 | 3b0f | 2400 | 0004 | 0002 | fbb0 | 0009 | 3b23 | a000 | 0001 | 0000 | 0044 | 0009 | 3b37 | a000 | 0004 | 0000 | 0048 | 0009 | 3b43 | a000 | 0048 |
| 2033460 | 0000 | 004c | 0000 | 0000 | 4400 | 00c3 | 0002 | fbb0 | 0000 | 0000 | 4400 | 00c3 | 0002 | fbc8 | 0000 | 0000 | 4400 | 00c4 | 0002 | fbc8 | 0000 | 0000 | 4400 | 00c5 |
| 2033540 | 0002 | fbe4 | 0000 | 0000 | 4400 | 00c7 | 0002 | fbf4 | 0000 | 0000 | 4400 | 00c8 | 0002 | fc04 | 0000 | 0000 | 4400 | 00c9 | 0002 | fc1c | 0000 | 0000 | 4400 | 00ca |

```
2033620  0002 fc30 0009 3b51 2400 0004 0002 fc40 0009 3b68 a000 0004 0000 0044 0009 3b74 a000 0048 0000 0048 0000 0000 4400 00d1
2033700  0002 fc40 0000 0000 4400 00d1 0002 fc54 0009 3b82 8000 0008 ffff fffc 0009 3b94 8000 000c ffff fff8 0009 3ba1 8000 0004
2033760  ffff fff4 0009 3bb3 8000 0004 ffff fff0 0000 0000 c000 0002 0000 050c 0000 0000 4400 00d6 0002 fc54 0000 0000 4400 00d8
2034040  0002 fc68 0000 0000 4400 00d9 0002 fc74 0000 0000 4400 00db 0002 fc8c 0000 0000 4400 00dd 0002 fca0 0000 0000 4400 00df
2034120  0002 fcd4 0000 0000 4400 00e0 0002 fce0 0000 0000 4400 00e1 0002 fcf0 0000 0000 4400 00e2 0002 fd00 0000 0000 4400 00e3
2034200  0002 fd0c 0000 0000 4400 00e4 0002 fd18 0000 0000 4400 00e5 0002 fd24 0000 0000 e000 0002 0000 05ec 0000 0000 4400 00e6
2034260  0002 fd34 0009 3bc7 2400 0001 0002 fd44 0009 3bd8 a000 0001 0000 0044 0009 3be1 a000 0048 0000 0048 0000 0000 4400 00eb
2034340  0002 fd44 0009 3bef 4000 0048 0000 0019 0000 0000 4400 00eb 0002 fd54 0009 3bfd 4000 0008 0000 001d 0000 0000 c000 0002
2034420  0000 c60c 0000 0000 4400 00ee 0002 fd54 0000 0000 4400 00ef 0002 fd60 0000 0000 4400 00f1 0002 fd74 0000 0000 4400 00f5
2034500  0002 fd88 0000 0000 4400 00f7 0002 fda4 0000 0000 4400 00fa 0002 fdc0 0000 0000 4400 00fc 0002 fdd0 0000 0000 4400 00fd
2034560  0002 fde4 0000 0000 4400 0100 0002 fe00 0000 0000 4400 0103 0002 fe10 0000 0000 e000 0002 0000 06d8 0000 0000 4400 0104
2034640  0002 fe20 0009 3c15 2400 0004 0002 fe30 0009 3c3d a000 0194 0000 0044 0009 3c4f a000 0008 0000 0048 0000 0000 4400 010b
2034720  0002 fe30 0000 0000 4400 010b 0002 fe44 0009 3c62 8000 0004 ffff fffc 0000 0000 c000 0002 0000 06fc 0000 0000 4400 010e
2035000  0002 fe44 0000 0000 4400 010f 0002 fe50 0000 0000 4400 0111 0002 fe60 0000 0000 4400 0113 0002 fe88 0000 0000 e000 0002
2035060  0000 0754 0000 0000 4400 0114 0002 fe9c 0009 3c6d 2400 0004 0002 feac 0009 3c8b a000 0008 0000 0044 0009 3c9f a000 0008
2035140  0000 0048 0000 0000 4400 011a 0002 feac 0000 0000 4400 011a 0002 fec0 0000 0000 4400 011b 0002 fec0 0000 0000 4400 011c
2035220  0002 fed0 0000 0000 4400 011d 0002 fedc 0009 3cb2 2400 0004 0002 feec 0009 3cc2 a000 0010 0000 0044 0009 3cce a000 0048
2035300  0000 0048 0000 0000 4400 0123 0002 feec 0000 0000 4400 0123 0002 ff00 0009 3cdc 8000 0010 ffff fffc 0000 0000 c000 0002
2035360  0000 07b8 0000 0000 4400 0126 0002 ff00 0000 0000 4400 0127 0002 ff10 0000 0000 4400 0128 0002 ff20 0000 0000 4400 0129
2035440  0002 ff2c 0000 0000 4400 012a 0002 ff3c 0000 0000 4400 012b 0002 ff4c 0000 0000 4400 012c 0002 ff58 0000 0000 4400 012d
2035520  0002 ff64 0000 0000 e000 0002 0000 082c 0000 0000 4400 012e 0002 ff74 0009 3ce8 2400 0004 0002 ff84 0009 3cfa a000 0010
2035600  0000 0044 0000 0000 4400 0133 0002 ff84 0000 0000 4400 0133 0002 ff94 0009 3d06 8000 0010 ffff fffc 0000 0000 c000 0002
2035660  0000 084c 0000 0000 4400 0136 0002 ff94 0000 0000 4400 0137 0002 ffa0 0000 0000 4400 0138 0002 ffb0 0000 0000 4400 0139
2035740  0002 ffc0 0000 0000 e000 0002 0000 0898 0000 0000 4400 013a 0002 ffd0 0009 3d12 2400 0001 0002 ffe0 0009 3d2b a000 0048
2036020  0000 0044 0000 0000 4400 013f 0002 ffe0 0000 0000 4400 013f 0002 fff0 0009 3d39 8000 0010 ffff fffc 0000 0000 c000 0002
2036100  0000 08a8 0000 0000 4400 0142 0002 fff0 0000 0000 4400 0145 0003 0004 0000 0000 4400 0147 0003 0020 0000 0000 4400 0149
2036160  0003 003c 0000 0000 4400 014b 0003 0048 0000 0000 4400 014c 0003 0064 0000 0000 4400 014d 0003 0070 0000 0000 4400 014e
2036240  0003 008c 0000 0000 4400 0145 0003 0098 0000 0000 4400 0151 0003 00ac 0000 0000 e000 0002 0000 0970 0000 0000 4400 0152
2036320  0003 00b8 0009 3d44 2400 0004 0003 00c8 0009 3d5c a000 0048 0000 0044 0000 0000 4400 0156 0003 00c8 0000 0000 4400 0156
2036400  0003 00d8 0009 3d6a 8000 0194 ffff fffc 0009 3d7b 8000 0004 ffff fff8 0000 0000 c000 0002 0000 0990 0000 0000 4400 015a
2036460  0003 00d8 0000 0000 4400 015b 0003 00e4 0000 0000 4400 015d 0003 00fc 0000 0000 4400 015b 0003 0120 0000 0000 4400 015e
2036540  0003 0134 0000 0000 e000 0002 0000 0a00 0000 0000 4400 015f 0003 0148 0009 3d86 2400 0004 0003 0158 0009 3daa a000 0008
2036620  0000 0044 0009 3dc2 a000 0004 0000 0048 0009 3dce a000 0048 0000 004c 0000 0000 4400 0167 0003 0158 0000 0000 4400 0167
2036700  0003 0170 0009 3ddc 8000 0008 ffff fffc 0000 0000 c000 0002 0000 0a28 0000 0000 4400 016a 0003 0170 0000 0000 4400 016c
2036760  0003 0188 0000 0000 4400 016a 0003 019c 0000 0000 e000 0002 0000 0a68 0000 0000 4400 016d 0003 01b0 0009 3dee 2400 0004
2037040  0003 01c0 0009 3e0d a000 0008 0000 0044 0009 3e20 a000 0004 0000 0048 0009 3e2c a000 0048 0000 004c 0000 0000 4400 0175
2037120  0003 01c0 0000 0000 4400 0175 0003 01d8 0000 0000 4400 0176 0003 01d8 0000 0000 4400 0177 0003 01f4 0000 0000 4400 0178
2037200  0003 0200 0000 0000 4400 0179 0003 0218 0000 0000 4400 017a 0003 0224 0000 0000 4400 017b 0003 0240 0000 0000 4400 017c
2037260  0003 024c 0009 3e3a 2400 0004 0003 025c 0009 3e5c a000 0008 0000 0044 0009 3e74 a000 0048 0000 0048 0000 0000 4400 0183
2037340  0003 025c 0000 0000 4400 0183 0003 0270 0009 3e82 8000 0008 ffff fffc 0000 0000 c000 0002 0000 0b28 0000 0000 4400 0187
2037420  0003 0270 0000 0000 4400 0188 0003 0298 0000 0000 4400 0187 0003 0298 0000 0000 e000 0002 0000 0b64 0000 0000 4400 0189
2037500  0003 02ac 0009 3e94 2400 0004 0003 02bc 0009 3eb1 a000 0008 0000 0044 0009 3ec4 a000 0048 0000 0048 0000 0000 4400 0190
2037560  0003 02bc 0000 0000 4400 0190 0003 02d0 0000 0000 4400 0191 0003 02d0 0000 0000 4400 0192 0003 02e4 0000 0000 4400 0193
2037640  0003 02f0 0000 0000 4400 0194 0003 0308 0000 0000 4400 0195 0003 0314 0000 0000 4400 0196 0003 0330 0000 0000 4400 0197
2037720  0003 033c 0009 3ed2 0400 0000 0003 0350 0009 3ed7 0600 0000 0004 7688 0009 3ee0 0400 0000 0003 0cc0 0009 3ef9 0600 0000
2040000  0004 7600 0009 3f00 0600 0000 0004 76cc 0009 3f07 0600 0000 0004 7644 0009 3f0e 0400 0000 0003 08c0 0009 3f21 6400 0000
2040060  0003 0350 0009 3f3e 6400 0000 0003 0350 0009 3f48 8000 0000 0000 0000 0009 3f72 8000 0000 0000 0000 0009 3f8c 8000 0000
2040140  0000 0000 0009 3fb7 8000 0000 0000 0000 0009 3fd9 8000 0000 0000 0000 0009 3ffc 8000 0000 0000 0000 0009 4022 8000 0000
2040220  0000 0000 0009 4044 8000 0000 0000 0000 0009 4065 8000 0000 0000 0000 0009 407e 8000 0000 0000 0000 0009 4099 8000 0000
2040300  0000 0000 0009 40ad 8000 0000 0000 0000 0009 40bf 8200 0000 0000 1038 0009 40cc 8400 0000 0003 0350 0009 40d9 2600 0001
2040360  0004 7600 0009 40f9 8000 0004 ffff fb05 0009 410d 8000 0004 ffff fb05 0000 0000 a200 0000 0000 0000 0009 411c 8200 0000
2040440  0000 1d48 0009 4129 8400 0000 0003 0350 0009 4136 2600 0001 0004 7644 0009 4143 8000 0001 ffff fb05 0009 41c5 8000 0004
2040520  ffff fb05 0009 41f4 8000 0004 ffff fb05 0000 0000 a200 0000 0000 0000 0009 4214 8200 0000 0000 07e7 0009 421e 8000 0004
2040600  ffff fb05 0000 0000 a200 0000 0000 0000 0009 424d 8200 0000 0000 0760 0009 425a c200 0000 0000 0000 0009 4270 8400 0000
2040660  0003 0350 0009 427d 2600 0001 0004 7688 0000 0000 a200 0000 0000 0000 0009 428c 8400 0000 0003 0350 0009 4296 2600 0001
```

```
2040740  0004 76cc 0009 42a3 8000 0000 ffff fb05 0009 42c7 8000 0000 ffff fb05 0009 42e0 8000 0000 ffff fb05 0009 430a 8000 0000
2041020  ffff fb05 0009 4326 8000 0024 ffff fb05 0009 443e 8000 001c ffff fb05 0009 44e9 2400 0004 0003 0350 0009 44fe a000 0004
2041100  0000 0044 0009 4514 a000 0004 0000 0048 0009 4530 a000 0001 0000 004c 0009 4546 a000 0000 0000 0050 0009 455c a000 0004
2041160  0000 0054 0000 0000 4400 0063 0003 0350 0000 0000 4400 0063 0003 0370 0009 456e 8000 0024 ffff fffc 0000 0000 c000 0002
2041240  0000 0020 0000 0000 4400 0066 0003 0370 0000 0000 4400 0068 0003 0380 0000 0000 4400 0069 0003 038c 0000 0000 4400 006a
2041320  0003 0398 0000 0000 4400 006b 0003 03a4 0000 0000 4400 006d 0003 03b0 0000 0000 4400 006f 0003 03b8 0000 0000 4400 0070
2041400  0003 03c0 0000 0000 4400 0071 0003 03c8 0000 0000 4400 0072 0003 03d8 0000 0000 4400 0074 0003 03e8 0000 0000 e000 0002
2041460  0000 00a4 0000 0000 4400 0075 0003 03f4 0009 4583 2400 0004 0003 0404 0009 45a0 a000 0004 0000 0044 0000 0000 4400 0081
2041540  0003 0404 0000 0000 4400 0081 0003 0414 0000 0000 4400 0086 0003 0414 0000 0000 4400 0087 0003 0440 0009 45ac 2400 0004
2041620  0003 0450 0009 45c8 a000 0004 0000 0044 0000 0000 4400 0096 0003 0450 0000 0000 4400 0096 0003 0460 0000 0000 4400 009b
2041700  0003 0460 0000 0000 4400 009c 0003 0490 0009 45d4 2400 0000 0003 04a0 0009 45ea a000 0004 0000 0044 0000 0000 4400 00a8
2041760  0003 04a0 0000 0000 4400 00a8 0003 04b0 0009 45fd 8000 0024 ffff fffc 0009 460a 8000 001c ffff fff8 0000 0000 c000 0002
2042040  0000 0160 0000 0000 4400 00ac 0003 04b0 0000 0000 4400 00ae 0003 04b8 0000 0000 4400 00b0 0003 04c8 0000 0000 4400 00b2
2042120  0003 04dc 0000 0000 4400 00b3 0003 04e8 0000 0000 4400 00b5 0003 04fc 0000 0000 4400 00b7 0003 0510 0000 0000 4400 00ba
2042200  0003 0528 0000 0000 4400 00bd 0003 053c 0000 0000 4400 00bf 0003 0548 0000 0000 e000 0002 0000 0200 0000 0000 4400 00c0
2042260  0003 0550 0009 4616 2400 0004 0003 0558 0009 462b a000 0004 0000 0044 0009 463f a000 0001 0000 0048 0000 0000 4400 00ce
2042340  0003 0558 0000 0000 4400 00ce 0003 056c 0009 464a 8000 0024 ffff fffc 0009 4657 4000 0004 0000 001d 0009 4669 4000 001c
2042420  0000 001c 0000 0000 c000 0002 0000 021c 0000 0000 4400 00d3 0003 056c 0000 0000 4400 00d5 0003 0574 0000 0000 4400 00d7
2042500  0003 05bc 0000 0000 4400 00d9 0003 05d4 0000 0000 4400 00db 0003 05e0 0000 0000 4400 00dd 0003 05e0 0000 0000 4400 00df
2042560  0003 05ec 0000 0000 4400 00e1 0003 05f8 0000 0000 4400 00e3 0003 0608 0000 0000 4400 00e5 0003 0614 0000 0000 4400 00e7
2042640  0003 0624 0000 0000 4400 00e9 0003 0630 0000 0000 4400 00eb 0003 0654 0000 0000 4400 00ef 0003 0660 0000 0000 4400 00db
2042720  0003 0664 0000 0000 e000 0002 0000 031c 0000 0000 4400 00f2 0003 066c 0009 4676 2400 0001 0003 067c 0009 468c a000 0004
2043000  0000 0044 0009 46a0 a000 0001 0000 0048 0000 0000 4400 0100 0003 067c 0000 0000 4400 0100 0003 0690 0009 46ab 8000 0024
2043060  ffff fffc 0009 46b8 4000 0004 0000 001d 0009 46ca 4000 001c 0000 001c 0000 0000 c000 0002 0000 0340 0000 0000 4400 0105
2043140  0003 0690 0000 0000 4400 0107 0003 0698 0000 0000 4400 0109 0003 06e0 0000 0000 4400 010b 0003 06f8 0000 0000 4400 010d
2043220  0003 0704 0000 0000 4400 010f 0003 0704 0000 0000 4400 0111 0003 0710 0000 0000 4400 0113 0003 071c 0000 0000 4400 0115
2043300  0003 072c 0000 0000 4400 0117 0003 0738 0000 0000 4400 0119 0003 0748 0000 0000 4400 011b 0003 0754 0000 0000 4400 011d
2043360  0003 0778 0000 0000 4400 0121 0003 0784 0000 0000 4400 010d 0003 0788 0000 0000 e000 0002 0000 0440 0000 0000 4400 0124
2043440  0003 0790 0009 46d7 2400 0004 0003 07a0 0009 46f0 a000 0004 0000 0044 0009 4704 a000 0001 0000 0048 0009 470f a000 0001
2043520  0000 004c 0000 0000 4400 0135 0003 07a0 0000 0000 4400 0135 0003 07b8 0000 0000 4400 0136 0003 07b8 0000 0000 4400 0138
2043600  0003 0800 0000 0000 4400 0139 0003 082c 0009 471b 2400 0004 0003 0830 0009 4735 a000 0004 0000 0044 0009 4749 a000 0001
2043660  0000 0048 0009 4754 a000 0001 0000 004c 0000 0000 4400 014b 0003 0830 0000 0000 4400 014b 0003 0848 0000 0000 4400 014c
2043740  0003 0848 0000 0000 4400 014e 0003 0890 0000 0000 4400 014f 0003 08b0 0009 4760 2400 0004 0003 08c0 0009 4779 a000 0024
2044020  0000 0044 0009 4787 a000 0001 0000 0048 0009 4792 a000 0001 0000 004c 0009 479e a000 0004 0000 0050 0000 0000 4400 0162
2044100  0003 08c0 0000 0000 4400 0162 0003 081c 0009 47ab 4000 0004 0000 001d 0009 47bd 4000 001c 0000 001c 0000 0000 c000 0002
2044160  0000 058c 0000 0000 4400 0166 0003 08dc 0000 0000 4400 0168 0003 08f4 0000 0000 4400 016a 0003 0900 0000 0000 4400 016c
2044240  0003 0900 0009 47d3 4000 001c 0000 001b 0000 0000 c000 0004 0000 05c0 0000 0000 4400 0170 0003 0910 0000 0000 4400 0172
2044320  0003 0920 0000 0000 4400 0173 0003 0930 0000 0000 4400 0175 0003 0944 0000 0000 4400 0177 0003 0958 0000 0000 4400 017b
2044400  0003 0968 0000 0000 4400 017e 0003 0980 0000 0000 4400 017f 0003 0984 0000 0000 4400 0180 0003 098c 0000 0000 4400 0182
2044460  0003 0998 0000 0000 4400 0183 0003 09a4 0000 0000 4400 0184 0003 09a8 0000 0000 4400 0185 0003 09b0 0000 0000 4400 0187
2044540  0003 09c0 0000 0000 4400 018a 0003 09c8 0000 0000 4400 018c 0003 09d0 0000 0000 e000 0004 0000 06a8 0000 0000 4400 018e
2044620  0003 09f8 0000 0000 4400 0193 0003 0a0c 0000 0000 4400 0192 0003 0a20 0000 0000 4400 0194 0003 0a34 0000 0000 4400 0196
2044700  0003 0a48 0000 0000 4400 0198 0003 0a70 0000 0000 4400 019a 0003 0a80 0000 0000 4400 019d 0003 0a8c 0000 0000 4400 01a1
2044760  0003 0a98 0000 0000 4400 016a 0003 0aa4 0000 0000 e000 0002 0000 075c 0000 0000 4400 01a4 0003 0aac 0009 47e0 2400 0001
2045040  0003 0abc 0009 47f9 a000 0004 0000 0044 0009 480d a000 0001 0000 0048 0000 0000 4400 01b3 0003 0abc 0000 0000 4400 01b3
2045120  0003 0ad0 0009 4818 8000 0024 ffff fffc 0009 4825 4000 0004 0000 001d 0009 4837 4000 001c 0000 001c 0009 4845 8000 0001
2045200  ffff fff8 0000 0000 c000 0002 0000 0780 0000 0000 4400 01b9 0003 0ad0 0000 0000 4400 01bb 0003 0ad8 0000 0000 4400 01bd
2045260  0003 0b20 0000 0000 4400 01bf 0003 0b38 0000 0000 4400 01c1 0003 0b44 0000 0000 4400 01c3 0003 0b44 0000 0000 4400 01c5
2045340  0003 0b54 0000 0000 4400 01c6 0003 0b58 0000 0000 4400 01c8 0003 0b60 0000 0000 4400 01ca 0003 0b74 0000 0000 4400 01cc
2045420  0003 0b88 0000 0000 4400 01ce 0003 0b9c 0000 0000 4400 01d0 0003 0bb0 0000 0000 4400 01d2 0003 0b18 0000 0000 4400 01d4
2045500  0003 0be4 0000 0000 4400 01d6 0003 0bf8 0000 0000 4400 01d8 0003 0c0c 0000 0000 4400 01da 0003 0c20 0000 0000 4400 01de
2045560  0003 0c3c 0000 0000 4400 01e1 0003 0c4c 0000 0000 4400 01e2 0003 0c5c 0000 0000 4400 01e3 0003 0c6c 0000 0000 4400 01e4
2045640  0003 0c80 0000 0000 4400 01e5 0003 0c88 0000 0000 4400 01e9 0003 0c90 0000 0000 4400 01c1 0003 0c9c 0000 0000 4400 01ed
2045720  0003 0ca4 0000 0000 e000 0002 0000 0960 0000 0000 4400 01ee 0003 0cb0 0009 484f 2400 0000 0003 0cc0 0009 486f a000 0000
2046000  0000 0044 0009 4885 a000 001c 0000 0048 0000 0000 4400 01fe 0003 0cc0 0009 4893 4000 001c 0000 0019 0000 0000 4400 01fe
```

```
2046060  0003 0cd0 0009 48a1 8000 001c ffff fffc 0000 0000 c000 0002 0000 0980 0000 0000 4400 0201 0003 0cd0 0000 0000 4400 0203
2046140  0003 0cd8 0000 0000 4400 0205 0003 0cec 0000 0000 4400 0207 0003 0d00 0000 0000 4400 0209 0003 0d14 0009 48ad 8000 001c
2046220  ffff fff8 0009 49ba 8000 001c ffff fff4 0000 0000 c000 0003 0000 09d8 0000 0000 4400 020f 0003 0128 0000 0000 4400 0210
2046300  0003 0d34 0000 0000 4400 0212 0003 0d4c 0000 0000 4400 0214 0003 0d64 0000 0000 4400 0215 0003 0470 0000 0000 4400 0216
2046360  0003 0d84 0000 0000 4400 0217 0003 0d94 0000 0000 4400 0218 0003 0da4 0000 0000 4400 021a 0003 0dbc 0000 0000 4400 021c
2046440  0003 0dc4 0000 0000 e000 0003 0000 0a7c 0000 0000 4400 021f 0003 0dcc 0000 0000 4400 0221 0003 0ddc 0000 0000 4400 0224
2046520  0003 0df0 0000 0000 e000 0002 0000 0aac 0000 0000 4400 0225 0003 0dfc 0009 48c9 2400 0001 0003 0e04 0009 48e4 a000 0004
2046600  0000 0044 0009 48f1 a000 0001 0000 0048 0009 4905 a000 0001 0000 004c 0009 4919 a000 0001 0000 0050 0000 0000 4400 0236
2046660  0003 0e04 0000 0000 4400 0236 0003 0e20 0009 4927 8000 0001 ffff fffc 0000 0000 c000 0002 0000 0ad0 0000 0000 4400 0239
2046740  0003 0e20 0000 0000 4400 023b 0003 0e68 0000 0000 4400 023d 0003 0e78 0000 0000 4400 0241 0003 0e8c 0000 0000 4400 0244
2047020  0003 0e98 0000 0000 4400 0246 0003 0ea8 0000 0000 4400 0247 0003 0eb8 0000 0000 4400 0248 0003 0ec8 0000 0000 4400 024c
2047100  0003 0ed4 0000 0000 4400 024d 0003 0ee8 0000 0000 e000 0002 0000 0ba4 0000 0000 4400 024f 0003 0ef4 0009 493f 2400 0004
2047160  0003 0f04 0009 4953 a000 0004 0000 0044 0000 0000 4400 025c 0003 0f04 0000 0000 4400 025c 0003 0f14 0000 0000 4400 025d
2047240  0003 0f14 0000 0000 4400 025f 0003 0f5c 0000 0000 4400 0260 0003 0f6c 0009 4960 2400 0004 0003 0f7c 0009 4977 a000 0004
2047320  0000 0044 0000 0000 4400 026d 0003 0f7c 0000 0000 4400 026d 0003 0f8c 0009 498a 8000 0024 ffff fffc 0009 4997 8000 0004
2047400  ffff fff8 0000 0000 4400 026f 0003 0f8c 0000 0000 c000 0002 0000 0c44 0000 0000 4400 0271 0003 0f94 0000 0000 4400 0273
2047460  0003 0f9c 0000 0000 4400 0275 0003 0fb4 0000 0000 4400 0277 0003 0fc0 0000 0000 4400 0279 0003 0fcc 0000 0000 4400 027b
2047540  0003 0fe8 0000 0000 4400 027d 0003 0ff4 0000 0000 4400 027f 0003 0ff8 0000 0000 4400 0281 0003 1014 0000 0000 4400 0283
2047620  0003 1020 0000 0000 4400 0285 0003 102c 0000 0000 4400 0287 0003 104c 0000 0000 4400 0289 0003 1058 0000 0000 4400 028c
2047700  0003 105c 0000 0000 e000 0002 0000 0d18 0000 0000 4400 028d 0003 1068 0009 49a1 2400 0004 0003 1078 0009 49b4 a000 0004
2047760  0000 0044 0000 0000 4400 029b 0003 1078 0000 0000 4400 029b 0003 1088 0009 49c7 8000 0024 ffff fffc 0000 0000 c000 0002
2050040  0000 0d38 0000 0000 4400 029e 0003 1088 0000 0000 4400 02a0 0003 1090 0000 0000 e000 0002 0000 0d8c 0000 0000 4400 02a1
2050120  0003 10dc 0009 49d4 0400 0000 0003 10f0 0009 49d9 0600 0000 0004 77cc 0009 49e0 0600 0000 0004 7788 0009 49e8 6400 0000
2050200  0003 10f0 0009 4a05 6400 0000 0003 10f0 0009 4a0f 8000 0000 0000 0000 0009 4a39 8000 0000 0000 0000 0009 4a53 8000 0000
2050260  0000 0000 0009 4a7e 8000 0000 0000 0000 0009 4aa0 8000 0000 0000 0000 0009 4ac3 8000 0000 0000 0000 0009 4ae9 8000 0000
2050340  0000 0000 0009 4b0b 8000 0000 0000 0000 0009 4b2c 8000 0000 0000 0000 0009 4b45 8000 0000 0000 0000 0009 4b60 8000 0000
2050420  0000 0000 0009 4b74 8000 0000 0000 0000 0009 4b86 2600 0001 0004 7788 0009 4ba8 c200 0000 0000 0ff2 0009 4bbd 8200 0000
2050500  0000 040c 0009 4bc7 8400 0000 0003 10f0 0009 4bd1 2600 0001 0004 77cc 0000 0000 a200 0000 0000 0000 0009 4bdf 8000 0001
2050560  ffff fb05 0009 4c42 2400 0004 0003 10f0 0009 4c5a a000 0004 0000 0044 0009 4c66 8400 0000 0003 10f0 0000 0000 4400 001c
2050640  0003 10f0 0000 0000 4400 001c 0003 1100 0000 0000 c000 0002 0000 0010 0000 0000 4400 001f 0003 1100 0000 0000 e000 0002
2050720  0000 0024 0000 0000 4400 0020 0003 1114 0009 4c70 2400 0000 0003 1124 0009 4c80 a000 0004 0000 0044 0000 0000 4400 0026
2051000  0003 1124 0000 0000 4400 0026 0003 1134 0000 0000 4400 0027 0003 1134 0000 0000 4400 0028 0003 1140 0009 4c8f 0400 0000
2051060  0003 1148 0009 4c94 0800 0000 0004 b330 0009 4c9d 0800 0000 0004 b430 0009 4ca6 0400 0000 0003 1a8c 0009 4cb6 0400 0000
2051140  0003 1148 0009 4cc7 0600 0000 0004 7898 0009 4cd0 0600 0000 0004 7810 0009 4cd7 0600 0000 0004 796c 0009 4ce9 0600 0000
2051220  0004 7854 0009 4cf0 0600 0000 0004 7960 0009 4cf8 0800 0000 0004 af30 0009 4d03 0800 0000 0004 b230 0009 4d11 0800 0000
2051300  0004 b130 0009 4d1f 0600 0000 0004 7920 0009 4d2b 0800 0000 0004 b630 0009 4d32 0600 0000 0004 78dc 0009 4d3d 0800 0000
2051360  0004 b030 0009 4d48 0600 0000 0004 7958 0009 4d50 0800 0000 0004 b530 0009 4d5d 0400 0000 0003 1cf8 0009 4d70 6400 0000
2051440  0003 1148 0009 4d8d 6400 0000 0003 1148 0009 4d97 8000 0000 0000 0000 0009 4dc1 8000 0000 0000 0000 0009 4ddb 8000 0000
2051520  0000 0000 0009 4e06 8000 0000 0000 0000 0009 4e28 8000 0000 0000 0000 0009 4e4b 8000 0000 0000 0000 0009 4e71 8000 0000
2051600  0000 0000 0009 4e93 8000 0000 0000 0000 0009 4eb4 8000 0000 0000 0000 0009 4ecd 8000 0000 0000 0000 0009 4ee8 8000 0000
2051660  0000 0000 0009 4efc 8000 0000 0000 0000 0009 4f0e 8200 0000 0000 1038 0009 4f1b 8400 0000 0003 1148 0009 4f29 2600 0001
2051740  0004 7810 0009 4f48 8000 0004 ffff fb05 0009 4f5c 8000 0004 ffff fb05 0000 0000 a200 0000 0000 0000 0009 4f6b 8200 0000
2052020  0000 1d48 0009 4f78 8400 0000 0003 1148 0009 4f85 2600 0001 0004 7854 0009 4f92 8000 0001 ffff fb05 0009 5014 8000 0004
2052100  ffff fb05 0009 5043 8000 0004 ffff fb05 0000 0000 a200 0000 0000 0000 0009 5063 8200 0000 0000 04ef 0009 506d c200 0000
2052160  0000 0000 0009 5083 8400 0000 0003 1148 0009 508d 2600 0001 0004 7898 0000 0000 a200 0000 0000 0000 0009 509c 8400 0000
2052240  0003 1148 0009 50a6 2600 0001 0004 78dc 0009 50b7 8000 0000 ffff fb05 0009 50ed 8000 0000 ffff fb05 0009 510f 8000 0010
2052320  ffff fb05 0009 5193 2600 0001 0004 7920 0009 51b9 2600 0001 0004 7958 0009 51da 2600 0001 0004 7960 0009 51fc 2600 0004
2052400  0004 796c 0009 5214 2800 0001 0004 af30 0009 523a 2800 0001 0004 b030 0009 524c 2800 0001 0004 b130 0009 5261 2800 0001
2052460  0004 b230 0009 5276 2800 0001 0004 b330 0009 5286 2800 0001 0004 b430 0009 5296 2800 0001 0004 b530 0009 52aa 2800 0001
2052540  0004 b630 0009 52b8 2400 0000 0003 1148 0000 0000 4400 0032 0003 1148 0000 0000 4400 0032 0003 1154 0009 52d0 8000 0001
2052620  ffff fffc 0009 52db 8000 0004 ffff fff8 0000 0000 c000 0002 0000 000c 0000 0000 4400 0036 0003 1154 0000 0000 4400 0038
2052700  0003 1168 0000 0000 4400 003a 0003 117c 0000 0000 4400 003b 0003 118c 0000 0000 4400 003c 0003 119c 0000 0000 4400 003d
2052760  0003 11ac 0000 0000 4400 003e 0003 11c0 0000 0000 4400 003f 0003 11d4 0000 0000 4400 0040 0003 11e4 0000 0000 4400 0041
2053040  0003 11f4 0000 0000 4400 0038 0003 1208 0000 0000 4400 0044 0003 121c 0000 0000 4400 0046 0003 1240 0000 0000 4400 0044
2053120  0003 1260 0000 0000 4400 0049 0003 1274 0000 0000 4400 004b 0003 1298 0000 0000 4400 004c 0003 12b8 0000 0000 4400 004d
```

| | | | | | | | | | | | | | | | | | | | | | | | | |
|---|---|---|---|---|---|---|---|---|---|---|---|---|---|---|---|---|---|---|---|---|---|---|---|---|
| 2053200 | 0003 | 12d8 | 0000 | 0000 | 4400 | 004e | 0003 | 12fc | 0000 | 0000 | 4400 | 004f | 0003 | 1320 | 0000 | 0000 | 4400 | 0050 | 0003 | 1340 | 0000 | 0000 | 4400 | 0049 |
| 2053260 | 0003 | 1360 | 0000 | 0000 | 4400 | 0053 | 0003 | 1374 | 0000 | 0000 | 4400 | 0055 | 0003 | 1388 | 0000 | 0000 | 4400 | 0056 | 0003 | 13b0 | 0000 | 0000 | 4400 | 0053 |
| 2053340 | 0003 | 13d8 | 0000 | 0000 | 4400 | 0059 | 0003 | 13ec | 0000 | 0000 | e000 | 0002 | 0000 | 02b0 | 0000 | 0000 | 4400 | 005b | 0003 | 13f8 | 0009 | 52e3 | 2400 | 0004 |
| 2053420 | 0003 | 1400 | 0009 | 5304 | a000 | 0001 | 0000 | 0044 | 0000 | 0000 | 4400 | 0067 | 0003 | 1400 | 0000 | 0000 | 4400 | 0067 | 0003 | 1410 | 0000 | 0000 | 4400 | 0068 |
| 2053500 | 0003 | 1410 | 0000 | 0000 | 4400 | 006a | 0003 | 142c | 0000 | 0000 | 4400 | 006b | 0003 | 144c | 0009 | 530d | 2400 | 0001 | 0003 | 145c | 0009 | 5326 | a000 | 0001 |
| 2053560 | 0000 | 0044 | 0000 | 0000 | 4400 | 0077 | 0003 | 145c | 0000 | 0000 | 4400 | 0077 | 0003 | 146c | 0000 | 0000 | 4400 | 0078 | 0003 | 146c | 0000 | 0000 | 4400 | 007a |
| 2053640 | 0003 | 1488 | 0000 | 0000 | 4400 | 007b | 0003 | 14a8 | 0009 | 532f | 2400 | 0000 | 0003 | 14b8 | 0009 | 534b | a000 | 0001 | 0000 | 0044 | 0000 | 0000 | 4400 | 0087 |
| 2053720 | 0003 | 14b8 | 0000 | 0000 | 4400 | 0087 | 0003 | 14c8 | 0009 | 5355 | 8000 | 0001 | ffff | fffc | 0000 | 0000 | c000 | 0002 | 0000 | 0380 | 0000 | 0000 | 4400 | 008a |
| 2054000 | 0003 | 14c8 | 0000 | 0000 | 4400 | 008c | 0003 | 14e4 | 0000 | 0000 | 4400 | 008d | 0003 | 1504 | 0000 | 0000 | 4400 | 008c | 0003 | 1528 | 0000 | 0000 | e000 | 0002 |
| 2054060 | 0000 | 03f4 | 0000 | 0000 | 4400 | 008e | 0003 | 153c | 0009 | 535e | 2400 | 0001 | 0003 | 1544 | 0009 | 5377 | a000 | 0001 | 0000 | 0044 | 0000 | 0000 | 4400 | 009a |
| 2054140 | 0003 | 1544 | 0000 | 0000 | 4400 | 009a | 0003 | 1554 | 0000 | 0000 | 4400 | 009b | 0003 | 1554 | 0000 | 0000 | 4400 | 009d | 0003 | 1570 | 0000 | 0000 | 4400 | 009e |
| 2054220 | 0003 | 1590 | 0009 | 538c | 2400 | 0000 | 0003 | 15a0 | 0009 | 539c | a000 | 0001 | 0000 | 0044 | 0000 | 0000 | 4400 | 00aa | 0003 | 15a0 | 0000 | 0000 | 4400 | 00aa |
| 2054300 | 0003 | 15b0 | 0009 | 53a6 | 8000 | 0001 | ffff | fffc | 0000 | 0000 | c000 | 0002 | 0000 | 0468 | 0000 | 0000 | 4400 | 00ad | 0003 | 15b0 | 0000 | 0000 | 4400 | 00af |
| 2054360 | 0003 | 15cc | 0000 | 0000 | 4400 | 00b0 | 0003 | 15ec | 0000 | 0000 | 4400 | 00af | 0003 | 1610 | 0000 | 0000 | e000 | 0002 | 0000 | 04dc | 0000 | 0000 | 4400 | 00b1 |
| 2054440 | 0003 | 1624 | 0009 | 53af | 2400 | 0001 | 0003 | 162c | 0009 | 53c8 | a000 | 0001 | 0000 | 0044 | 0009 | 53d3 | a000 | 0001 | 0000 | 0048 | 0000 | 0000 | 4400 | 00bf |
| 2054520 | 0003 | 162c | 0000 | 0000 | 4400 | 00bf | 0003 | 1640 | 0009 | 53de | 8000 | 0001 | ffff | fffc | 0009 | 53ea | 8000 | 0001 | ffff | fff8 | 0000 | 0000 | c000 | 0002 |
| 2054600 | 0000 | 04f8 | 0000 | 0000 | 4400 | 00c3 | 0003 | 1640 | 0000 | 0000 | 4400 | 00c5 | 0003 | 1650 | 0000 | 0000 | 4400 | 00c6 | 0003 | 1684 | 0000 | 0000 | 4400 | 00c7 |
| 2054660 | 0003 | 16b0 | 0000 | 0000 | 4400 | 00c8 | 0003 | 16c4 | 0000 | 0000 | 4400 | 00c9 | 0003 | 16f0 | 0000 | 0000 | 4400 | 00ca | 0003 | 1704 | 0000 | 0000 | 4400 | 00cb |
| 2054740 | 0003 | 170c | 0000 | 0000 | 4400 | 00cc | 0003 | 171c | 0000 | 0000 | 4400 | 00cd | 0003 | 1728 | 0000 | 0000 | 4400 | 00ce | 0003 | 1730 | 0000 | 0000 | e000 | 0002 |
| 2055020 | 0000 | 05f4 | 0000 | 0000 | 4400 | 00cf | 0003 | 173c | 0009 | 53f5 | 2400 | 0004 | 0003 | 174c | 0009 | 540b | a000 | 0001 | 0000 | 0044 | 0000 | 0000 | 4400 | 00db |
| 2055100 | 0003 | 174c | 0009 | 5418 | 4000 | 0001 | 0000 | 0018 | 0000 | 0000 | 4400 | 00db | 0003 | 1758 | 0009 | 5425 | 4000 | 0004 | 0000 | 031d | 0000 | 0000 | 4400 | 00dc |
| 2055160 | 0003 | 1758 | 0000 | 0000 | c000 | 0002 | 0000 | 061c | 0000 | 0000 | 4400 | 00de | 0003 | 1764 | 0000 | 0000 | 4400 | 00df | 0003 | 1770 | 0000 | 0000 | 4400 | 00e1 |
| 2055240 | 0003 | 177c | 0000 | 0000 | 4400 | 00e3 | 0003 | 1790 | 0000 | 0000 | 4400 | 00e5 | 0003 | 17a0 | 0000 | 0000 | 4400 | 00e6 | 0003 | 17a8 | 0000 | 0000 | 4400 | 00e9 |
| 2055320 | 0003 | 17b8 | 0000 | 0000 | 4400 | 00ea | 0003 | 17c0 | 0000 | 0000 | 4400 | 00eb | 0003 | 17c8 | 0000 | 0000 | 4400 | 00ec | 0003 | 17d0 | 0000 | 0000 | 4400 | 00ed |
| 2055400 | 0003 | 17d8 | 0000 | 0000 | 4400 | 00ee | 0003 | 17e0 | 0000 | 0000 | 4400 | 00ef | 0003 | 17e8 | 0000 | 0000 | 4400 | 00f0 | 0003 | 17f0 | 0000 | 0000 | 4400 | 00f1 |
| 2055460 | 0003 | 17f8 | 0000 | 0000 | 4400 | 00f2 | 0003 | 1800 | 0000 | 0000 | 4400 | 00f4 | 0003 | 1808 | 0000 | 0000 | e000 | 0002 | 0000 | 06cc | 0000 | 0000 | 4400 | 00f5 |
| 2055540 | 0003 | 1814 | 0009 | 5430 | 2400 | 0004 | 0003 | 1824 | 0009 | 5443 | a000 | 0001 | 0000 | 0044 | 0000 | 0000 | 4400 | 0101 | 0003 | 1824 | 0000 | 0000 | 4400 | 0101 |
| 2055620 | 0003 | 1834 | 0000 | 0000 | 4400 | 0102 | 0003 | 1834 | 0000 | 0000 | 4400 | 0104 | 0003 | 1850 | 0000 | 0000 | 4400 | 0105 | 0003 | 1870 | 0009 | 544c | 2400 | 0004 |
| 2055700 | 0003 | 1880 | 0009 | 545f | a000 | 0001 | 0000 | 0044 | 0000 | 0000 | 4400 | 0110 | 0003 | 1880 | 0000 | 0000 | 4400 | 0110 | 0003 | 1890 | 0000 | 0000 | 4400 | 0111 |
| 2055760 | 0003 | 1890 | 0000 | 0000 | 4400 | 0113 | 0003 | 18ac | 0000 | 0000 | 4400 | 0114 | 0003 | 18cc | 0009 | 5468 | 2400 | 0004 | 0003 | 18dc | 0009 | 547b | a000 | 0001 |
| 2056040 | 0000 | 0044 | 0000 | 0000 | 4400 | 0120 | 0003 | 18dc | 0000 | 0000 | 4400 | 0120 | 0003 | 18ec | 0000 | 0000 | 4400 | 0121 | 0003 | 18ec | 0000 | 0000 | 4400 | 0123 |
| 2056120 | 0003 | 1908 | 0000 | 0000 | 4400 | 0124 | 0003 | 1928 | 0009 | 5484 | 2400 | 0004 | 0003 | 1938 | 0009 | 5497 | a000 | 0001 | 0000 | 0044 | 0000 | 0000 | 4400 | 012f |
| 2056200 | 0003 | 1938 | 0000 | 0000 | 4400 | 012f | 0003 | 1948 | 0000 | 0000 | 4400 | 0130 | 0003 | 1948 | 0000 | 0000 | 4400 | 0132 | 0003 | 1964 | 0000 | 0000 | 4400 | 0133 |
| 2056260 | 0003 | 1984 | 0009 | 54a0 | 2400 | 0004 | 0003 | 1994 | 0009 | 54b3 | a000 | 0001 | 0000 | 0044 | 0000 | 0000 | 4400 | 013e | 0003 | 1994 | 0000 | 0000 | 4400 | 013e |
| 2056340 | 0003 | 19a4 | 0000 | 0000 | 4400 | 013f | 0003 | 19a4 | 0000 | 0000 | 4400 | 0141 | 0003 | 19c0 | 0000 | 0000 | 4400 | 0142 | 0003 | 19e0 | 0009 | 54bc | 2400 | 0004 |
| 2056420 | 0003 | 19f0 | 0009 | 54d6 | a000 | 0001 | 0000 | 0044 | 0000 | 0000 | 4400 | 014d | 0003 | 19f0 | 0000 | 0000 | 4400 | 014d | 0003 | 1a00 | 0000 | 0000 | 4400 | 014e |
| 2056500 | 0003 | 1a00 | 0000 | 0000 | 4400 | 0150 | 0003 | 1a1c | 0000 | 0000 | 4400 | 0151 | 0003 | 1a7c | 0009 | 54df | 2400 | 0001 | 0003 | 1a8c | 0009 | 54f6 | a000 | 0001 |
| 2056560 | 0000 | 0044 | 0000 | 0000 | 4400 | 0161 | 0003 | 1a8c | 0000 | 0000 | 4400 | 0161 | 0003 | 1a9c | 0009 | 5503 | 2800 | 0001 | 0004 | b730 | 0000 | 0000 | 4400 | 0162 |
| 2056640 | 0003 | 1a9c | 0009 | 5517 | 2600 | 0004 | 0004 | 7970 | 0009 | 552a | 8000 | 0001 | ffff | fffc | 0009 | 5535 | 8000 | 0004 | ffff | fff8 | 0000 | 0000 | c000 | 0002 |
| 2056720 | 0000 | 0164 | 0000 | 0000 | 4400 | 0167 | 0003 | 1a9c | 0000 | 0000 | 4400 | 0169 | 0003 | 1ab0 | 0000 | 0000 | 4400 | 016b | 0003 | 1ac8 | 0000 | 0000 | 4400 | 016d |
| 2057000 | 0003 | 1ad8 | 0000 | 0000 | 4400 | 0171 | 0003 | 1aec | 0000 | 0000 | 4400 | 0174 | 0003 | 1af8 | 0000 | 0000 | 4400 | 0177 | 0003 | 1b10 | 0000 | 0000 | 4400 | 0179 |
| 2057060 | 0003 | 1b1c | 0000 | 0000 | 4400 | 017b | 0003 | 1b1c | 0000 | 0000 | 4400 | 017d | 0003 | 1b30 | 0000 | 0000 | 4400 | 017f | 0003 | 1b70 | 0000 | 0000 | e000 | 0002 |
| 2057140 | 0000 | 0a34 | 0000 | 0000 | 4400 | 0180 | 0003 | 1b7c | 0009 | 5542 | 2400 | 0001 | 0003 | 1b8c | 0009 | 5561 | a000 | 0001 | 0000 | 0044 | 0000 | 0000 | 4400 | 0190 |
| 2057220 | 0003 | 1b8c | 0000 | 0000 | 4400 | 0190 | 0003 | 1b9c | 0009 | 5570 | 2600 | 0010 | 0004 | 7974 | 0009 | 557d | 2600 | 0004 | 0004 | 7978 | 0009 | 5591 | 4000 | 0010 |
| 2057300 | 0000 | 001d | 0009 | 55a7 | 4000 | 0004 | 0000 | 001c | 0009 | 55b9 | 4000 | 0004 | 0000 | 001b | 0000 | 0000 | c000 | 0002 | 0000 | 0a60 | 0000 | 0000 | 4400 | 0197 |
| 2057360 | 0003 | 1ba8 | 0000 | 0000 | 4400 | 0199 | 0003 | 1bbc | 0000 | 0000 | 4400 | 019a | 0003 | 1bcc | 0000 | 0000 | 4400 | 019d | 0003 | 1bdc | 0000 | 0000 | 4400 | 019f |
| 2057440 | 0003 | 1bec | 0000 | 0000 | 4400 | 01a2 | 0003 | 1bfc | 0000 | 0000 | 4400 | 01a4 | 0003 | 1c3c | 0000 | 0000 | 4400 | 01a7 | 0003 | 1c4c | 0000 | 0000 | 4400 | 01a9 |
| 2057520 | 0003 | 1c58 | 0000 | 0000 | 4400 | 01ad | 0003 | 1c6c | 0000 | 0000 | 4400 | 01b1 | 0003 | 1c80 | 0000 | 0000 | 4400 | 01b3 | 0003 | 1c90 | 0000 | 0000 | 4400 | 01b4 |
| 2057600 | 0003 | 1ca0 | 0000 | 0000 | 4400 | 01b5 | 0003 | 1cb4 | 0000 | 0000 | 4400 | 01b6 | 0003 | 1cbc | 0000 | 0000 | 4400 | 01b7 | 0003 | 1cd0 | 0000 | 0000 | 4400 | 01b9 |
| 2057660 | 0003 | 1cd8 | 0000 | 0000 | e000 | 0002 | 0000 | 0ba0 | 0000 | 0000 | 4400 | 01ba | 0003 | 1ce8 | 0009 | 55c4 | 8000 | 0008 | ffff | fb05 | 0009 | 5608 | 8000 | 0008 |
| 2057740 | ffff | fb05 | 0009 | 561d | 8000 | 0008 | ffff | fb05 | 0009 | 563a | 2400 | 0008 | 0003 | 1cf8 | 0009 | 5654 | a000 | 0001 | 0000 | 0044 | 0000 | 0000 | 4400 | 01cf |
| 2060020 | 0003 | 1cf8 | 0000 | 0000 | 4400 | 01cf | 0003 | 1d08 | 0009 | 5661 | 8000 | 0008 | ffff | fff8 | 0000 | 0000 | c000 | 0002 | 0000 | 0bc0 | 0000 | 0000 | 4400 | 01d2 |
| 2060100 | 0003 | 1d08 | 0000 | 0000 | 4400 | 01d3 | 0003 | 1d0c | 0000 | 0000 | 4400 | 01d5 | 0003 | 1d10 | 0000 | 0000 | 4400 | 01d7 | 0003 | 1110 | 0000 | 0000 | 4400 | 01d9 |
| 2060160 | 0003 | 1d1c | 0000 | 0000 | 4400 | 01db | 0003 | 1d34 | 0000 | 0000 | 4400 | 01dd | 0003 | 1d50 | 0000 | 0000 | 4400 | 01df | 0003 | 1d5c | 0000 | 0000 | 4400 | 01e1 |
| 2060240 | 0003 | 1d78 | 0000 | 0000 | e000 | 0002 | 0000 | 0c3c | 0000 | 0000 | 4400 | 01e2 | 0003 | 1d84 | 0009 | 566c | 2400 | 0004 | 0003 | 1190 | 0009 | 5683 | a000 | 0001 |

```
2060320  0000 0044 0009 568e a000 0001 0000 0048 0000 0000 4400 01f1 0003 1d90 0000 0000 4400 01f1 0003 1da4 0009 5699 8000 0008
2060400  ffff fff8 0009 56a3 8000 0008 ffff fff0 0009 56ad 8000 0004 ffff ffec 0000 0000 c000 0002 0000 0c5c 0000 0000 4400 01f6
2060460  0003 1da4 0000 0000 4400 01f8 0003 1da4 0000 0000 4400 01fa 0003 1ddc 0000 0000 4400 01fb 0003 1e18 0000 0000 4400 01fc
2060540  0003 1e3c 0000 0000 4400 01fd 0003 1e48 0000 0000 4400 0200 0003 1e5c 0000 0000 4400 0201 0003 1e38 0000 0000 4400 0203
2060620  0003 1eb4 0000 0000 4400 0205 0003 1ed0 0000 0000 4400 0208 0003 1edc 0000 0000 4400 020a 0003 1ef8 0000 0000 4400 020d
2060700  0003 1f04 0000 0000 4400 020e 0003 1f14 0000 0000 4400 01f6 0003 1f24 0000 0000 e000 0002 0000 0de4 0000 0000 4400 0210
2060760  0003 1f2c 0009 56b7 2400 0004 0003 1f3c 0009 56d0 a000 0001 0000 0044 0009 56db a000 0001 0000 0048 0000 0000 4400 021d
2061040  0003 1f3c 0000 0000 4400 021d 0003 1f50 0000 0000 4400 021e 0003 1f50 0000 0000 4400 021f 0003 1f68 0009 56e6 2400 0004
2061120  0003 1f78 0009 5706 a000 0001 0000 0044 0009 5711 a000 0001 0000 0048 0000 0000 4400 022c 0003 1f78 0000 0000 4400 022c
2061200  0003 1f8c 0000 0000 4400 022d 0003 1f8c 0000 0000 4400 022f 0003 1fa8 0000 0000 4400 0231 0003 1fec 0000 0000 4400 0233
2061260  0003 2004 0000 0000 4400 022f 0003 2010 0000 0000 4400 0237 0003 2030 0000 0000 4400 0238 0003 2078 0009 571c 0400 0000
2061340  0003 2088 0009 5721 0800 0000 0004 b738 0009 5730 0400 0000 0003 21e0 0009 5734 6400 0000 0003 21e0 0000 0000 4400 ffff
2061420  0003 21e0 0009 573b 0400 0000 0003 21e0 0009 5744 0400 0000 0003 21e0 0009 574a 0500 078c 0003 b1a4 0009 5751 0700 06e1
2061500  0004 7d20 0009 5758 0900 05cc 0004 b740 0009 575d 0500 050e 0000 2020 0009 5763 0500 037e 0000 b564 0009 5769 0700 0572
2061560  0003 c2e8 0009 5772 0500 0727 0002 cc98 0009 579d 0500 0728 0002 cc6c 0009 57c8 0500 0653 0000 76d4 0009 57e1 0500 0775
2061640  0000 2c08 0009 57fa 0500 07b7 0000 76a8 0009 5913 0500 003b 0000 2bdc 0009 582c 0500 06c1 0000 4b58 0009 5850 0500 0273
2061720  0000 4b2c 0009 5874 0500 0729 0000 c2d0 0009 5891 0500 06d5 0000 d928 0009 58ae 0500 038f 0000 c2a4 0009 58cb 0500 033b
2062000  0000 d8fc 0009 58e8 0500 0131 0000 dee8 0009 5902 0500 07cb 0002 8604 0009 591c 0500 03f9 0000 debc 0009 5936 0500 01f5
2062060  0002 85d8 0009 5950 0700 057d 0003 c358 0009 5958 0700 056d 0003 c2f0 0009 5960 0500 0243 0002 99a0 0009 597e 0500 0073
2062140  0002 a25c 0009 599c 0500 039f 0000 3078 0009 59ba 0500 03ad 0002 9974 0009 59d8 0500 01dd 0002 a230 0009 59f6 0500 0509
2062220  0000 304c 0009 5a14 0500 0371 0000 4ea0 0009 5a2b 0500 0819 0000 4e74 0009 5a42 0500 0049 0002 ab08 0009 5a64 0500 05ad
2062300  0002 aadc 0009 5a86 0500 05a7 0002 ba74 0009 5ab3 0500 05a8 0002 ba48 0009 5ae0 0500 04a5 0002 b3c0 0009 5afb 0500 006b
2062360  0002 c088 0009 5b16 0500 037f 0000 44c0 0009 5b31 0500 0197 0002 b394 0009 5b4c 0500 05fb 0002 c048 0009 5b67 0500 0071
2062440  0000 4494 0009 5b82 0500 0755 0000 8f10 0009 5ba1 0500 018b 0000 8ee4 0009 5bc0 0500 0035 0003 21c4 0009 5bd8 0500 00d3
2062520  0000 6a7c 0009 5bf0 0500 00e7 0003 21ac 0009 5c08 0500 0185 0000 6a3c 0009 5c20 0500 0827 0000 add0 0009 5c43 0500 027d
2062600  0000 c6e4 0009 5c66 0500 01af 0000 ada4 0009 5c89 0500 04a3 0000 c6b8 0009 5cac 0500 05d1 0002 7978 0009 5cc8 0500 00fb
2062660  0000 7f68 0009 5ce4 0500 0853 0002 794c 0009 5d00 0500 037d 0000 7f3c 0009 5d1c 0500 0331 0000 b7cc 0009 5d43 0500 0332
2062740  0000 b738 0009 5d6a 0900 03db 0004 7d20 0009 5d7a 0500 03d4 0000 bac0 0009 5d82 0500 0362 0000 2674 0009 5da1 0700 0446
2063020  0004 7988 0009 5db5 0500 00c1 0000 2838 0009 5dd8 0900 0776 0004 7d24 0009 5df4 0500 0095 0000 26ec 0009 5e14 0700 05f9
2063100  0004 7990 0009 5e26 0500 044f 0000 28c8 0009 5e4c 0900 0556 0004 7d28 0009 5e68 0700 06bf 0004 798c 0009 5e7b 0500 025e
2063160  0000 2610 0009 5e94 0500 0315 0000 23ec 0009 5eab 0700 0412 0003 c3c0 0009 5eb2 0900 0324 0004 7d30 0009 5ebd 0900 059b
2063240  0004 7f30 0009 5ecf 0900 0745 0004 7f34 0009 5ede 0500 0221 0000 b62c 0009 5ee9 0500 07d2 0000 bcd8 0009 5ef1 0700 0866
2063320  0003 c3c4 0009 5ef9 0700 086e 0003 c3c8 0009 5f01 0500 084c 0000 bd70 0009 5f09 0500 005f 0000 2880 0009 5f2b 0900 07db
2063400  0004 7f38 0009 5f37 0900 07dc 0004 8138 0009 5f43 0700 05e7 0004 7994 0009 5f54 0500 086b 0000 2efc 0009 5f76 0700 007c
2063460  0003 c58c 0009 5f97 0700 04ca 0003 c56c 0009 5fb8 0700 040a 0003 c568 0009 5fd9 0700 0801 0003 c510 0009 5fec 0700 07f7
2063540  0003 d714 0009 5ffd 0500 015f 0000 2d9c 0009 6014 0700 0554 0003 c590 0009 6033 0500 0301 0000 2fe0 0009 6047 0700 044c
2063620  0003 dab0 0009 6058 0700 015a 0003 c6f8 0009 6078 0700 0834 0003 c6c8 0009 6098 0700 05be 0003 c6c0 0009 60b8 0500 0247
2063700  0000 3db8 0009 60e6 0500 0695 0000 38dc 0009 610d 0500 07e9 0000 3afc 0009 612d 0500 04e2 0001 142c 0009 6137 0700 0740
2063760  0003 dba0 0009 6146 0700 0762 0003 c65c 0009 614d 0900 03d0 0004 8338 0009 6153 0500 019d 0000 3678 0009 6176 0500 0863
2064040  0000 c0e4 0009 6189 0700 0072 0003 d734 0009 619d 0700 0450 0003 c6d0 0009 61bb 0700 0044 0003 c6f4 0009 61dd 0700 0047
2064120  0003 c6d4 0009 61ff 0700 0760 0003 c6c4 0009 6221 0700 07b3 0003 cacc 0009 6231 0700 05a5 0003 db28 0009 6241 0500 07b1
2064200  0000 3748 0009 626c 0500 011f 0000 40d8 0009 62a3 0900 07d3 0004 8388 0009 62aa 0700 0595 0003 c620 0009 62af 0700 0596
2064260  0003 c624 0009 62b4 0700 0006 0003 c660 0009 62c8 0700 0258 0003 c628 0009 62d4 0700 042a 0003 c6bc 0009 62f3 0700 0382
2064340  0003 c6cc 0009 6312 0500 0222 0000 42c8 0009 6346 0500 0358 0000 3f88 0009 6368 0500 00ad 0002 be78 0009 6383 0700 0318
2064420  0003 c6b8 0009 63a6 0700 0432 0004 26ac 0009 63b7 0700 0854 0003 c8c8 0009 63c8 0500 03e7 0000 3c2c 0009 63ed 0700 05ef
2064500  0003 d724 0009 63fc 0500 049c 0000 3fe8 0009 641b 0500 0026 0000 3d4c 0009 643a 0500 0205 0000 3544 0009 6452 0500 051d
2064560  0000 4918 0009 6467 0700 02ec 0003 c950 0009 6484 0700 05a0 0003 c920 0009 64a1 0500 0478 0000 4ac0 0009 64ba 0500 0786
2064640  0000 4a54 0009 64d3 0700 04f7 0003 d6f8 0009 64e5 0700 0686 0003 c928 0009 6500 0500 059d 0000 4874 0009 651d 0700 0606
2064720  0003 c94c 0009 653c 0700 00a4 0003 c92c 0009 655b 0700 0781 0003 c924 0009 6577 0700 02de 0003 cab4 0009 6597 0700 009c
2065000  0003 ca88 0009 65c2 0700 009d 0003 ca30 0009 65ed 0700 01c8 0003 cab0 0009 660f 0700 01ca 0003 ca90 0009 6631 0700 004a
2065060  0003 ca8c 0009 6653 0500 0330 0000 56e8 0009 666b 0500 0068 0000 56ac 0009 6683 0700 078f 0003 d704 0009 6694 0500 02db
2065140  0000 53d4 0009 66af 0500 0430 0000 637c 0009 66c9 0500 03d6 0000 60a8 0009 66e3 0500 02e2 0000 5900 0009 66fd 0500 085f
2065220  0000 5628 0009 6711 0500 015d 0000 d054 0009 6726 0500 0426 0000 5e60 0009 6746 0700 0032 0003 cb98 0009 6760 0500 054a
2065300  0000 5b08 0009 677b 0500 07be 0000 bc1c 0009 6785 0700 088e 0003 cbbc 0009 67a3 0700 018e 0003 cb9c 0009 67c1 0700 07ec
2065360  0003 cb8c 0009 67df 0700 02d0 0003 cac8 0009 67e5 0700 023e 0003 d754 0009 67ed 0700 072e 0003 cb24 0009 6808 0700 04fc
```

```
2065440  0003 cb94 0009 6823 0500 01e6 0000 5e14 0009 683d 0500 03c1 0000 5d78 0009 685b 0500 0862 0000 61dc 0009 6877 0700 001e
2065520  0003 cb88 0009 6896 0500 02c6 0000 5724 0009 68ad 0500 0711 0002 c98c 0009 68c8 0500 0016 0000 5f94 0009 68e3 0500 0283
2065600  0000 d1e8 0009 68f7 0500 01bf 0000 54a8 0009 690b 0500 0680 0000 65d8 0009 6924 0700 02b2 0003 cbc0 0009 6940 0700 0182
2065660  0003 cb90 0009 695c 0700 040c 0003 cb28 0009 6978 0500 089b 0000 5dc8 0009 6997 0700 0507 0003 d020 0009 699c 0700 042c
2065740  0003 cb84 0009 69c3 0700 042d 0003 cb2c 0009 69ea 0700 03fc 0003 d0b4 0009 6a0a 0700 01d2 0003 d094 0009 6a2a 0700 071a
2066020  0003 d080 0009 6a47 0700 06f0 0003 d08c 0009 6a64 0500 069d 0000 6fe4 0009 6a81 0700 0574 0003 d024 0009 6a97 0500 0292
2066100  0000 735c 0009 6ab7 0700 0666 0003 d0b8 0009 6ad5 0700 01a6 0003 d088 0009 6af3 0700 0334 0003 d084 0009 6b11 0500 0648
2066160  0000 72e0 0009 6b2f 0500 00a0 0000 7264 0009 6b4d 0500 0605 0000 c1f4 0009 6b63 0500 042e 0000 71b4 0009 6b81 0700 0694
2066240  0003 d07c 0009 6ba4 0700 04fd 0003 d090 0009 6bc0 0700 03ea 0003 d2a0 0009 6bdd 0700 018a 0003 d270 0009 6bfa 0700 069e
2066320  0003 d26c 0009 6c17 0700 0033 0003 d208 0009 6c2a 0500 07e2 0000 7de0 0009 6c47 0700 0850 0003 d264 0009 6c69 0700 0784
2066400  0003 d278 0009 6c84 0500 07d7 0000 7cc4 0009 6c9b 0700 0704 0003 d29c 0009 6cba 0700 01a2 0003 d27c 0009 6cd9 0700 0022
2066460  0003 d260 0009 6cf8 0700 0444 0003 d268 0009 6d14 0700 087e 0003 d274 0009 6d30 0500 06e8 0000 8da4 0009 6d51 0500 0234
2066540  0000 89f4 0009 6d6c 0500 07fc 0000 84f4 0009 6d87 0700 0876 0003 d39c 0009 6da7 0700 019c 0003 d3cc 0009 6dc7 0700 0600
2066620  0003 d398 0009 6de7 0700 0250 0003 d390 0009 6e0c 0700 0492 0003 d3a4 0009 6e2a 0700 0088 0003 d3a8 0009 6e4c 0700 05c8
2066700  0003 d38c 0009 6e6e 0700 0087 0003 d3c8 0009 6e90 0700 04e3 0003 d330 0009 6ea4 0700 046c 0003 d394 0009 6ec3 0700 03c4
2066760  0003 d3a0 0009 6ee2 0500 045c 0000 8e64 0009 6f00 0700 05b4 0003 d389 0009 6f23 0500 02e6 0000 c8ac 0009 6f3e 0500 0314
2067040  0000 d778 0009 6f51 0500 04ad 0000 d2c4 0009 6f67 0500 0675 0000 8474 0009 6f7f 0500 0646 0002 1dc4 0009 6f88 0700 06d6
2067120  0003 d560 0009 6fa8 0700 07de 0003 d564 0009 6fcc 0700 030c 0003 d4e4 0009 6ff0 0700 07df 0003 d584 0009 7014 0700 01d6
2067200  0003 d554 0009 7038 0700 03c2 0003 d4d8 0009 703e 0500 008b 0000 aa60 0009 7052 0500 008d 0000 ad5c 0009 7062 0700 00ff
2067260  0003 d4cc 0009 7065 0700 0100 0003 d4c4 0009 7068 0500 0659 0000 9790 0009 708a 0500 0474 0002 1824 0009 7094 0500 030f
2067340  0002 3954 0009 709e 0500 04cf 0002 1750 0009 70a8 0700 063a 0003 d4ec 0009 70c9 0700 039a 0003 d55c 0009 70ea 0700 0103
2067420  0003 d4c8 0009 70ed 0500 081b 0000 ac30 0009 70fe 0700 0418 0003 d4dc 0009 7104 0700 02b8 0003 d4e0 0009 7129 0700 01ee
2067500  0003 d550 0009 714e 0500 083a 0000 bb60 0009 7158 0700 010a 0003 d4c0 0009 715b 0500 0662 0002 e3a8 0009 716d 0500 0795
2067560  0002 1120 0009 7178 0700 051e 0003 d558 0009 719a 0700 0390 0003 d588 0009 71bc 0700 03e4 0003 d4f0 0009 71de 0700 010e
2067640  0003 d4d0 0009 71e1 0700 032a 0003 d4f4 0009 720e 0700 032b 0003 d54c 0009 723b 0500 0714 0002 3000 0009 7243 0700 0114
2067720  0003 d4d4 0009 7246 0500 0030 0002 29ec 0009 7252 0700 0668 0003 d4e8 0009 7279 0700 06c6 0003 d764 0009 729d 0700 0396
2070000  0003 d7dc 0009 72ba 0900 0249 0004 8398 0009 72c8 0700 0192 0003 d800 0009 72e9 0700 05e0 0003 d7e0 0009 730a 0700 0520
2070060  0003 d7d0 0009 732b 0700 0882 0003 d760 0009 734c 0500 0328 0000 db64 0009 735b 0700 07d6 0003 d768 0009 7379 0700 077e
2070140  0003 d7d8 0009 7397 0500 02c1 0002 b87c 0009 73be 0700 02e1 0003 d744 0009 73cf 0700 02fa 0003 d7cc 0009 73f1 0700 0877
2070220  0003 d75c 0009 7413 0700 066a 0003 d804 0009 7432 0700 0588 0003 d7d4 0009 7451 0700 089d 0003 d76c 0009 7470 0700 025d
2070300  0003 d758 0009 7474 0700 00fa 0003 d7c8 0009 749e 0700 00fe 0003 d770 0009 74c8 0900 016c 0004 8798 0009 74d5 0700 06cd
2070360  0003 d8c8 0009 74dc 0700 03b9 0003 d8e4 0009 74e2 0500 0898 0002 13fc 0009 74ed 0700 07fd 0003 d8e0 0009 74f4 0700 02c7
2070440  0004 7998 0009 74fd 0500 0873 0000 bf1c 0009 7504 0500 0771 0002 3b44 0009 7510 0700 0321 0003 d8ec 0009 7516 0700 046a
2070520  0003 da84 0009 7537 0700 0692 0003 da28 0009 7559 0700 0690 0003 da80 0009 757b 0500 0707 0000 c634 0009 7596 0700 0899
2070600  0003 dad0 0009 75b6 0500 075d 0000 c680 0009 75cb 0500 044a 0000 d10c 0009 75e3 0500 0300 0000 cdf0 0009 75fb 0500 008c
2070660  0000 ca8c 0009 7616 0500 03f2 0000 cf64 0009 7632 0700 060e 0003 db64 0009 764f 0700 0858 0003 db68 0009 7670 0700 040b
2070740  0003 db88 0009 7691 0500 0681 0000 dc38 0009 76aa 0700 0158 0003 db60 0009 76c8 0700 0045 0003 db8c 0009 76e7 0500 0845
2071020  0000 ce04 0009 7709 0500 0274 0000 cc44 0009 771c 0700 0248 0003 dbfc 0009 773c 0700 001f 0003 dbdc 0009 775c 0500 05ff
2071100  0000 dca8 0009 7775 0700 04b2 0003 dc00 0009 7793 0500 0347 0000 ddec 0009 77a6 0500 07a6 0000 dcf4 0009 77c5 0700 0348
2071160  0003 dbd8 0009 77e1 0700 0767 0003 debc 0009 77ea 0900 05ed 0004 8898 0009 77f3 0500 07c6 0000 e130 0009 77fc 0500 0805
2071240  0000 ee98 0009 7805 0500 06f4 0001 1158 0009 780e 0900 0839 0004 889c 0009 7816 0700 0208 0003 deb0 0009 7820 0500 068b
2071320  0001 0098 0009 7829 0500 0673 0001 02b8 0009 7832 0900 07b8 0004 88a0 0009 783b 0500 0830 0001 2368 0009 7844 0500 0881
2071400  0001 0e98 0009 784d 0700 057e 0003 de58 0009 7856 0500 0370 0001 13cc 0009 7863 0500 0010 0001 846c 0009 786d 0700 0011
2071460  0003 e5dc 0009 7877 0500 0393 0001 0a10 0009 7881 0700 03b0 0003 de5c 0009 7887 0900 07d5 0004 8f08 0009 7890 0500 03b1
2071540  0001 3b08 0009 789a 0500 0380 0001 4184 0009 78a4 0500 054b 0001 29fc 0009 78ae 0500 00bb 0001 3fa8 0009 78b7 0500 0083
2071620  0001 0cac 0009 78c0 0900 0815 0004 8f0c 0009 78c9 0900 09a7 0004 8f10 0009 78d2 0900 07f5 0004 8f14 0009 78db 0500 07fe
2071700  0000 f324 0009 78e8 0500 06c5 0001 9498 0009 78ef 0700 06c4 0004 1b40 0009 7907 0500 0106 0002 cd70 0009 7910 0500 0142
2071760  0000 fc2c 0009 7919 0500 0172 0000 f91c 0009 7922 0500 06a5 0000 e438 0009 792c 0900 06c7 0004 8f18 0009 7936 0700 0327
2072040  0003 de78 0009 7940 0500 06f1 0000 f3c8 0009 794a 0500 0578 0001 21a0 0009 7954 0500 057a 0001 16a4 0009 795e 0700 0356
2072120  0003 de70 0009 7968 0500 0792 0000 f2bc 0009 7972 0700 039b 0003 de6c 0009 797c 0700 02c0 0004 1b3c 0009 7986 0500 0504
2072200  0001 29c0 0009 7990 0500 0583 0001 0878 0009 799a 0500 05aa 0001 2c30 0009 79a5 0500 0860 0001 42d8 0009 79af 0500 07c2
2072260  0000 e4a8 0009 79b6 0500 04be 0001 2538 0009 79c1 0700 024b 0003 de74 0009 79cb 0500 0241 0001 0bc8 0009 79d6 0500 07d4
2072340  0001 c25c 0009 79dd 0700 03e0 0003 de60 0009 79e3 0500 0027 0000 e5b0 0009 79ed 0900 014f 0004 8f1c 0009 79f7 0500 059e
2072420  0001 9848 0009 79ff 0900 0661 0004 8f20 0009 7a07 0500 002e 0002 cdb4 0009 7a11 0500 035f 0002 d414 0009 7a1b 0900 0709
2072500  0004 8f24 0009 7a23 0500 042f 0001 3010 0009 7a2e 0500 073a 0000 ed04 0009 7a39 0500 069a 0001 44f4 0009 7a41 0500 06b1
```

| | | | | | | | | | | | | | | | | | | | | | | | | |
|---|---|---|---|---|---|---|---|---|---|---|---|---|---|---|---|---|---|---|---|---|---|---|---|---|
| 2072560 | 0002 | 6640 | 0009 | 7a49 | 0500 | 03aa | 0001 | 4c3c | 0009 | 7a55 | 0500 | 010b | 0001 | 00f4 | 0009 | 7a60 | 0700 | 0857 | 0003 | e7c8 | 0009 | 7a67 | 0700 | 081c |
| 2072640 | 0003 | de68 | 0009 | 7a6e | 0900 | 06e9 | 0004 | 8f28 | 0009 | 7a76 | 0500 | 071b | 0000 | e080 | 0009 | 7a7e | 0700 | 06c8 | 0003 | de54 | 0009 | 7a86 | 0700 | 024c |
| 2072720 | 0004 | 1b38 | 0009 | 7a95 | 0500 | 029a | 0001 | 2268 | 0009 | 7aa4 | 0500 | 0419 | 0001 | 248c | 0009 | 7aaf | 0500 | 06c2 | 0001 | cb2c | 0009 | 7ab7 | 0500 | 0744 |
| 2073000 | 0000 | e580 | 0009 | 7ac3 | 0900 | 033f | 0004 | 8f2c | 0009 | 7acc | 0500 | 088f | 0000 | eafc | 0009 | 7ad7 | 0500 | 0003 | 0000 | e6cc | 0009 | 7adf | 0500 | 0524 |
| 2073060 | 0000 | f170 | 0009 | 7aea | 0500 | 0872 | 0000 | ff80 | 0009 | 7af2 | 0500 | 0855 | 0000 | fee8 | 0009 | 7afa | 0500 | 0884 | 0000 | fb94 | 0009 | 7b02 | 0700 | 0363 |
| 2073140 | 0003 | de4c | 0009 | 7b0f | 0700 | 032e | 0004 | 7aa0 | 0009 | 7b15 | 0500 | 0549 | 0002 | 5260 | 0009 | 7b1e | 0500 | 072c | 0002 | 6710 | 0009 | 7b26 | 0500 | 04d7 |
| 2073220 | 0002 | 65c0 | 0009 | 7b2f | 0500 | 0604 | 0001 | 0bec | 0009 | 7b3b | 0500 | 054d | 0000 | e0e0 | 0009 | 7b44 | 0500 | 0770 | 0001 | 6d44 | 0009 | 7b50 | 0500 | 0383 |
| 2073300 | 0000 | e3c4 | 0009 | 7b56 | 0500 | 0367 | 0001 | 22d0 | 0009 | 7b62 | 0700 | 0399 | 0003 | de64 | 0009 | 7b68 | 0900 | 078d | 0004 | 8f30 | 0009 | 7b71 | 0700 | 018f |
| 2073360 | 0004 | 09c0 | 0009 | 7b7b | 0500 | 07aa | 0001 | 2fa0 | 0009 | 7b86 | 0500 | 06ee | 0001 | 3ad0 | 0009 | 7b91 | 0500 | 0229 | 0001 | 2d5c | 0009 | 7ba0 | 0700 | 0505 |
| 2073440 | 0004 | 09c4 | 0009 | 7ba9 | 0500 | 0655 | 0001 | 9440 | 0009 | 7bb2 | 0500 | 0302 | 0001 | 3bb0 | 0009 | 7bbc | 0500 | 06ca | 0001 | 93c0 | 0009 | 7bc4 | 0500 | 0731 |
| 2073520 | 0001 | 3d88 | 0009 | 7bcf | 0500 | 0508 | 0001 | fdb0 | 0009 | 7bd8 | 0500 | 0604 | 0001 | 72cc | 0009 | 7be1 | 0500 | 00be | 0001 | 598c | 0009 | 7bea | 0500 | 07bf |
| 2073600 | 0001 | 8420 | 0009 | 7bf4 | 0500 | 077d | 0001 | 82f0 | 0009 | 7bfe | 0500 | 0388 | 0002 | 50b4 | 0009 | 7c08 | 0500 | 004e | 0001 | 4594 | 0009 | 7c12 | 0500 | 07ca |
| 2073660 | 0001 | 8388 | 0009 | 7c1c | 0500 | 001c | 0001 | 4a9c | 0009 | 7c26 | 0500 | 0814 | 0001 | 5878 | 0009 | 7c30 | 0500 | 07ed | 0001 | 5710 | 0009 | 7c3a | 0500 | 0025 |
| 2073740 | 0001 | 8984 | 0009 | 7c44 | 0500 | 042b | 0001 | 621c | 0009 | 7c51 | 0500 | 073f | 0001 | 9594 | 0009 | 7c58 | 0500 | 025f | 0001 | 833c | 0009 | 7c62 | 0500 | 0257 |
| 2074020 | 0001 | 6c60 | 0009 | 7c6c | 0500 | 02ac | 0001 | 8314 | 0009 | 7c76 | 0500 | 028c | 0001 | 4c7c | 0009 | 7c80 | 0500 | 0014 | 0001 | 90ac | 0009 | 7c8b | 0500 | 02af |
| 2074100 | 0001 | 7028 | 0009 | 7c95 | 0500 | 056c | 0001 | 7520 | 0009 | 7c9f | 0500 | 0552 | 0001 | 8b34 | 0009 | 7cb5 | 0500 | 006e | 0001 | 64f4 | 0009 | 7cc0 | 0500 | 000e |
| 2074160 | 0001 | 5504 | 0009 | 7ccb | 0500 | 0761 | 0001 | 8fa8 | 0009 | 7cd5 | 0500 | 061e | 0001 | 80b4 | 0009 | 7cdd | 0500 | 0813 | 0001 | ee18 | 0009 | 7ce4 | 0500 | 078b |
| 2074240 | 0001 | eae4 | 0009 | 7ceb | 0500 | 07e4 | 0001 | dcd4 | 0009 | 7cf2 | 0500 | 07af | 0001 | fcb4 | 0009 | 7cf9 | 0500 | 0219 | 0001 | 7c00 | 0009 | 7d04 | 0500 | 076e |
| 2074320 | 0001 | 6984 | 0009 | 7d0f | 0500 | 062e | 0001 | 4e14 | 0009 | 7d1a | 0500 | 008a | 0001 | 60a8 | 0009 | 7d25 | 0500 | 00b6 | 0001 | 5d34 | 0009 | 7d30 | 0500 | 06bb |
| 2074400 | 0001 | 8810 | 0009 | 7d38 | 0500 | 0885 | 0001 | 6818 | 0009 | 7d44 | 0500 | 040e | 0001 | 8248 | 0009 | 7d4d | 0500 | 03e8 | 0001 | 7f20 | 0009 | 7d56 | 0500 | 01f0 |
| 2074460 | 0001 | 7b70 | 0009 | 7d61 | 0500 | 06e5 | 0001 | e630 | 0009 | 7d69 | 0500 | 075b | 0001 | 94f0 | 0009 | 7d71 | 0500 | 077a | 0001 | 719c | 0009 | 7d79 | 0500 | 02d2 |
| 2074540 | 0001 | 7660 | 0009 | 7d84 | 0500 | 019e | 0001 | 7aa0 | 0009 | 7d8f | 0500 | 03dc | 0001 | 58e0 | 0009 | 7d98 | 0500 | 0437 | 0001 | 8910 | 0009 | 7d9f | 0500 | 0560 |
| 2074620 | 0002 | 5140 | 0009 | 7da8 | 0500 | 0427 | 0001 | 453c | 0009 | 7db1 | 0500 | 03d2 | 0001 | 5798 | 0009 | 7dba | 0500 | 051c | 0001 | 5a90 | 0009 | 7dc3 | 0500 | 03fe |
| 2074700 | 0001 | 5698 | 0009 | 7dcc | 0500 | 001a | 0001 | 8ca0 | 0009 | 7dd4 | 0500 | 057b | 0001 | 7894 | 0009 | 7de0 | 0500 | 06a8 | 0001 | 6440 | 0009 | 7ded | 0500 | 0184 |
| 2074760 | 0001 | 5b94 | 0009 | 7df9 | 0500 | 015e | 0001 | 5ea0 | 0009 | 7e05 | 0500 | 0806 | 0001 | 52a0 | 0009 | 7e12 | 0500 | 06d7 | 0001 | 978c | 0009 | 7e1b | 0500 | 04d9 |
| 2075040 | 0001 | 9344 | 0009 | 7e24 | 0500 | 0630 | 0001 | 9230 | 0009 | 7e2d | 0500 | 065e | 0001 | a190 | 0009 | 7e3a | 0500 | 067a | 0001 | a0fc | 0009 | 7e44 | 0500 | 05b8 |
| 2075120 | 0001 | a1dc | 0009 | 7e4e | 0500 | 04c3 | 0001 | 9ca0 | 0009 | 7e5b | 0500 | 0431 | 0002 | ea4c | 0009 | 7e64 | 0500 | 007a | 0001 | 9d7c | 0009 | 7e6e | 0500 | 083b |
| 2075200 | 0001 | a064 | 0009 | 7e78 | 0500 | 0856 | 0001 | 9f40 | 0009 | 7e82 | 0500 | 0189 | 0001 | a420 | 0009 | 7e8f | 0500 | 02fc | 0001 | a360 | 0009 | 7e9c | 0500 | 0254 |
| 2075260 | 0003 | 0e04 | 0009 | 7eb1 | 0500 | 008e | 0001 | a0dc | 0009 | 7ebf | 0500 | 04eb | 0001 | a228 | 0009 | 7ecc | 0500 | 086d | 0002 | e9e0 | 0009 | 7ed6 | 0500 | 04fa |
| 2075340 | 0001 | a2cc | 0009 | 7ee0 | 0500 | 041c | 0001 | a488 | 0009 | 7eea | 0500 | 0438 | 0001 | a3a4 | 0009 | 7ef4 | 0500 | 021a | 0002 | e490 | 0009 | 7f02 | 0500 | 0667 |
| 2075420 | 0001 | 9dc4 | 0009 | 7f0d | 0500 | 059c | 0001 | a26c | 0009 | 7f17 | 0500 | 039d | 0001 | a4ec | 0009 | 7f25 | 0500 | 0242 | 0003 | 0350 | 0009 | 7f34 | 0500 | 0779 |
| 2075500 | 0003 | 0558 | 0009 | 7f43 | 0500 | 01c3 | 0001 | a2a0 | 0009 | 7f51 | 0500 | 06c9 | 0001 | a30c | 0009 | 7f5c | 0500 | 0838 | 0003 | 0abc | 0009 | 7f6f | 0500 | 0019 |
| 2075560 | 0003 | 07a0 | 0009 | 7f82 | 0500 | 0420 | 0002 | e420 | 0009 | 7f91 | 0500 | 0359 | 0001 | 9b64 | 0009 | 7fa0 | 0500 | 07f8 | 0001 | 9b40 | 0009 | 7faf | 0500 | 012a |
| 2075640 | 0001 | a144 | 0009 | 7fba | 0500 | 0061 | 0003 | 0404 | 0009 | 7fd1 | 0500 | 04a2 | 0003 | 067c | 0009 | 7fe1 | 0500 | 06a1 | 0001 | 9bc0 | 0009 | 7fee | 0500 | 0461 |
| 2075720 | 0001 | 9a6c | 0009 | 7ffb | 0500 | 0062 | 0001 | 9a38 | 0009 | 8008 | 0500 | 0001 | 0001 | 9fdc | 0009 | 8015 | 0500 | 0174 | 0001 | 9edc | 0009 | 8022 | 0700 | 05ab |
| 2076000 | 0003 | f384 | 0009 | 802b | 0500 | 078e | 0001 | eb98 | 0009 | 8034 | 0500 | 050b | 0001 | e79c | 0009 | 803d | 0500 | 0764 | 0001 | f8a0 | 0009 | 8046 | 0500 | 024e |
| 2076060 | 0001 | f994 | 0009 | 8050 | 0500 | 02ef | 0001 | d56c | 0009 | 805a | 0500 | 055a | 0002 | 72f4 | 0009 | 8064 | 0700 | 0246 | 0003 | f388 | 0009 | 806e | 0500 | 062d |
| 2076140 | 0001 | ff10 | 0009 | 807b | 0500 | 023f | 0001 | fe34 | 0009 | 8085 | 0500 | 028d | 0002 | 01c8 | 0009 | 808f | 0900 | 004f | 0004 | 9264 | 0009 | 809a | 0500 | 07f9 |
| 2076220 | 0001 | fba8 | 0009 | 80a1 | 0500 | 0797 | 0001 | f9fc | 0009 | 80a8 | 0500 | 0798 | 0001 | f28c | 0009 | 80af | 0500 | 07c7 | 0001 | f068 | 0009 | 80b6 | 0900 | 054c |
| 2076300 | 0004 | 9268 | 0009 | 80c1 | 0700 | 044b | 0003 | f39c | 0009 | 80cc | 0500 | 083c | 0001 | f7cc | 0009 | 80d4 | 0500 | 0576 | 0001 | f620 | 0009 | 80e0 | 0700 | 050d |
| 2076360 | 0004 | 09d8 | 0009 | 80e9 | 0500 | 020f | 0002 | 0074 | 0009 | 80f9 | 0900 | 085a | 0004 | 926c | 0009 | 8106 | 0500 | 05fa | 0002 | 2a6c | 0009 | 810f | 0500 | 0618 |
| 2076440 | 0002 | 2db8 | 0009 | 8118 | 0500 | 05c2 | 0002 | 296c | 0009 | 8121 | 0500 | 086c | 0002 | 1668 | 0009 | 812e | 0500 | 03ba | 0002 | 28c8 | 0009 | 8138 | 0500 | 04af |
| 2076520 | 0002 | 15ec | 0009 | 8142 | 0500 | 020c | 0002 | 3a40 | 0009 | 8150 | 0900 | 002f | 0004 | 9270 | 0009 | 815b | 0500 | 01a9 | 0002 | 1b74 | 0009 | 8166 | 0500 | 0090 |
| 2076600 | 0002 | 1580 | 0009 | 8171 | 0500 | 0874 | 0002 | 161c | 0009 | 817d | 0500 | 06b2 | 0002 | 1c70 | 0009 | 8189 | 0500 | 03a7 | 0002 | 1510 | 0009 | 8199 | 0500 | 032f |
| 2076660 | 0002 | 5040 | 0009 | 81a3 | 0700 | 0165 | 0004 | 09e8 | 0009 | 81ad | 0700 | 0201 | 0004 | 09c8 | 0009 | 81b7 | 0700 | 01e0 | 0004 | 094c | 0009 | 81c1 | 0700 | 01b0 |
| 2076740 | 0004 | 09ec | 0009 | 81cb | 0700 | 014c | 0004 | 09e4 | 0009 | 81d5 | 0500 | 03a3 | 0002 | 51cc | 0009 | 81e3 | 0700 | 0521 | 0004 | 09f8 | 0009 | 81ee | 0700 | 0511 |
| 2077020 | 0004 | 09f4 | 0009 | 81f9 | 0700 | 047b | 0004 | 09bc | 0009 | 8204 | 0700 | 04d5 | 0004 | 09e0 | 0009 | 820d | 0700 | 0517 | 0004 | 09d0 | 0009 | 8216 | 0700 | 052a |
| 2077100 | 0004 | 09d4 | 0009 | 821f | 0700 | 0522 | 0004 | 09cc | 0009 | 8229 | 0700 | 001a | 0004 | 09f0 | 0009 | 8235 | 0500 | 02f4 | 0002 | db08 | 0009 | 8246 | 0500 | 033a |
| 2077160 | 0002 | 6548 | 0009 | 8257 | 0500 | 0119 | 0002 | 6694 | 0009 | 8260 | 0700 | 005c | 0004 | 32a0 | 0009 | 8272 | 0500 | 027e | 0002 | e938 | 0009 | 827d | 0500 | 0265 |
| 2077240 | 0002 | ed04 | 0009 | 8288 | 0500 | 0214 | 0002 | dcdc | 0009 | 829b | 0500 | 03df | 0002 | e770 | 0009 | 82aa | 0500 | 044d | 0002 | f054 | 0009 | 82c4 | 0500 | 0004 |
| 2077320 | 0002 | 678c | 0009 | 82d6 | 0700 | 0373 | 0004 | 329c | 0009 | 82e6 | 0500 | 0738 | 0002 | e518 | 0009 | 82f6 | 0500 | 0752 | 0002 | 67b0 | 0009 | 82ff | 0500 | 003e |
| 2077400 | 0002 | 69b8 | 0009 | 830b | 0500 | 009a | 0002 | 6d60 | 0009 | 8315 | 0500 | 0812 | 0002 | 6c1c | 0009 | 8323 | 0500 | 04db | 0002 | 6c58 | 0009 | 832f | 0500 | 019b |
| 2077460 | 0002 | 78dc | 0009 | 8355 | 0500 | 06da | 0002 | 77a0 | 0009 | 8377 | 0500 | 01cb | 0002 | 768c | 0009 | 838b | 0700 | 049e | 0004 | 1c84 | 0009 | 83ac | 0700 | 0439 |
| 2077540 | 0004 | 1cfc | 0009 | 83c6 | 0700 | 03f6 | 0004 | 1d20 | 0009 | 83e4 | 0700 | 0594 | 0004 | 1d00 | 0009 | 8402 | 0700 | 0354 | 0004 | 1cf0 | 0009 | 8420 | 0700 | 04d4 |
| 2077620 | 0004 | 1c80 | 0009 | 843e | 0700 | 0542 | 0004 | 1c40 | 0009 | 844e | 0700 | 0296 | 0004 | 1c88 | 0009 | 8469 | 0700 | 008f | 0004 | 1c78 | 0009 | 8484 | 0700 | 0064 |

```
2077700  0004 1cf8 0009 849f 0500 0167 0002 bce0 0009 84bc 0700 0424 0004 1cec 0009 84db 0700 02ad 0004 1c7c 0009 84fa 0500 01f8
2077760  0002 b980 0009 851c 0500 078a 0002 bc0c 0009 8530 0700 0783 0004 26a8 0009 8538 0700 06b8 0004 1d24 0009 8554 0700 0589
2100040  0004 1cf4 0009 8570 0700 0816 0004 1c8c 0009 858c 0700 0832 0004 1ce8 0009 85b3 0700 0833 0004 1c90 0009 85da 0700 07ce
2100120  0004 1da0 0009 85e8 0700 0462 0004 1de8 0009 8601 0700 01ae 0004 1e58 0009 861a 0700 06ea 0004 1e4c 0009 8637 0700 068c
2100200  0004 1ddc 0009 8654 0700 0342 0004 1e84 0009 866e 0700 02f6 0004 1e54 0009 8688 0700 05c0 0004 1dec 0009 86a2 0700 017a
2100260  0004 1e48 0009 86c7 0700 017b 0004 1df0 0009 86ec 0500 0233 0002 84dc 0009 8710 0700 0684 0004 1dd8 0009 8727 0500 0546
2100340  0002 7fb8 0009 8747 0500 0150 0002 7f84 0009 8759 0700 04e6 0004 1de4 0009 8778 0700 06f9 0004 1e5c 0009 8790 0700 0069
2100420  0004 1e80 0009 87ac 0700 0746 0004 1e60 0009 87c8 0700 06b6 0004 1e50 0009 87e4 0700 0716 0004 1de0 0009 8800 0700 00e4
2100500  0004 2068 0009 8820 0700 0758 0004 2048 0009 8840 0700 06fa 0004 2038 0009 8860 0700 045d 0004 1fc8 0009 8880 0700 00ab
2100560  0004 1f88 0009 8892 0700 0402 0004 1fd0 0009 88af 0700 03d8 0004 2040 0009 88cc 0700 0198 0004 2034 0009 88ed 0700 0456
2100640  0004 1fc4 0009 890e 0700 034e 0004 206c 0009 892c 0700 072d 0004 203c 0009 894a 0700 0018 0004 1fd4 0009 8968 0700 0098
2100720  0004 2030 0009 8991 0700 0099 0004 1fd8 0009 89ba 0500 00d9 0002 9504 0009 89e2 0500 0223 0002 8de0 0009 8a06 0700 0514
2101000  0004 1fc0 0009 8a25 0500 0038 0002 8c0c 0009 8a3b 0700 037c 0004 1fcc 0009 8a5e 0700 01e4 0004 2044 0009 8a7a 0700 067b
2101060  0004 2328 0009 8a9a 0700 0451 0004 2308 0009 8aba 0700 03f3 0004 22f8 0009 8ada 0700 0154 0004 2288 0009 8afa 0700 0700
2101140  0004 2248 0009 8b0c 0700 0113 0004 2290 0009 8b29 0700 00d0 0004 2300 0009 8b46 0700 072f 0004 22f4 0009 8b67 0700 014e
2101220  0004 2284 0009 8b88 0700 0056 0004 232c 0009 8ba6 0700 0425 0004 22fc 0009 8bc4 0700 05ae 0004 2294 0009 8be2 0700 062f
2101300  0004 22f0 0009 8c0b 0700 0632 0004 2298 0009 8c34 0500 07f3 0002 a18c 0009 8c5c 0500 0654 0002 9fe0 0009 8c80 0700 0124
2101360  0004 2280 0009 8c9f 0500 0824 0002 9fac 0009 8cb5 0700 0074 0004 228c 0009 8cd8 0700 077b 0004 2304 0009 8cf4 0700 0343
2101440  0004 2454 0009 8d14 0500 0320 0002 a948 0009 8d3d 0700 044e 0004 2478 0009 8d61 0700 0453 0004 2458 0009 8d85 0700 06e0
2101520  0004 2448 0009 8da9 0700 0817 0004 23d8 0009 8dcd 0500 01c0 0002 a864 0009 8de8 0700 0573 0004 23d0 0009 8e10 0700 02a6
2101600  0004 23e0 0009 8e31 0700 0007 0004 2450 0009 8e52 0700 06f8 0004 2444 0009 8e77 0700 07c3 0004 23d4 0009 8e9c 0700 0410
2101660  0004 2398 0009 8eb3 0700 089a 0004 247c 0009 8ed5 0700 0193 0004 244c 0009 8ef7 0700 0050 0004 23e4 0009 8f19 0700 0835
2101740  0004 2440 0009 8f46 0700 083d 0004 23e8 0009 8f73 0500 0535 0002 aa60 0009 8fa0 0700 02d4 0004 23dc 0009 8fc7 0700 0209
2102020  0004 253c 0009 8fe7 0700 005d 0004 2530 0009 9000 0700 0624 0004 25b4 0009 9019 0700 01b2 0004 25d8 0009 9036 0700 06d0
2102100  0004 25b8 0009 9053 0700 05b0 0004 25a8 0009 9070 0700 0670 0004 2538 0009 908d 0700 06f2 0004 24f8 0009 909c 0700 0104
2102160  0004 2540 0009 90b6 0700 043a 0004 25b0 0009 90d0 0700 0619 0004 25a4 0009 90ee 0700 055c 0004 2534 0009 910c 0700 0763
2102240  0004 25dc 0009 9127 0700 06ce 0004 25ac 0009 9142 0700 03c0 0004 2544 0009 915d 0700 03d3 0004 25a0 0009 9183 0700 03e2
2102320  0004 2548 0009 91a9 0500 01e3 0002 b31c 0009 91ce 0500 0580 0002 b14c 0009 91ef 0500 016a 0002 b114 0009 9202 0500 030d
2102400  0002 b9e4 0009 9224 0700 036c 0004 26e4 0009 9241 0700 05cd 0004 2714 0009 925e 0700 00c8 0004 26ec 0009 9279 0700 0385
2102460  0004 26f0 0009 9298 0700 0048 0004 2710 0009 92b7 0700 01c2 0004 26e8 0009 92d3 0500 0217 0002 bf24 0009 92f2 0700 039e
2102540  0004 27c4 0009 9312 0700 06fc 0004 27cc 0009 9332 0700 02a4 0004 27f8 0009 9353 0700 07ba 0004 27c8 0009 9374 0700 06a9
2102620  0004 27c0 0009 9392 0700 082e 0004 27bc 0009 93b4 0700 00ee 0004 27b8 0009 93d6 0700 0080 0004 27b0 0009 93f5 0700 0894
2102700  0004 27d0 0009 9414 0700 007d 0004 27f4 0009 9437 0700 0085 0004 27d4 0009 945a 0700 010f 0004 27b4 0009 9481 0500 0561
2102760  0002 ddec 0009 9492 0500 068d 0002 e030 0009 94ab 0500 028f 0003 10f0 0009 94b5 0500 030e 0002 dc94 0009 94c8 0500 00fc
2103040  0002 dbf0 0009 94d8 0500 0013 0002 dab0 0009 94ec 0500 0304 0002 dd50 0009 9500 0500 0183 0002 de38 0009 9513 0500 058d
2103120  0003 1124 0009 951c 0500 001d 0002 f748 0009 9542 0500 0475 0002 e22c 0009 9556 0500 07a8 0002 f36c 0009 956a 0500 0020
2103200  0002 f288 0009 957e 0500 017e 0002 f1c8 0009 9592 0500 05a6 0002 eec0 0009 959f 0500 01a3 0002 f3bc 0009 95b7 0500 0712
2103260  0002 e328 0009 95cf 0500 01b9 0002 ead8 0009 95e0 0700 071d 0004 3298 0009 95f1 0700 0846 0004 3290 0009 9602 0500 01fc
2103340  0002 ec8c 0009 9613 0500 05de 0002 ef30 0009 9624 0500 0457 0002 f200 0009 9635 0500 0859 0002 e3f4 0009 9647 0500 0043
2103420  0002 fd44 0009 9652 0500 05c7 0002 f348 0009 9673 0500 07f0 0002 e268 0009 9682 0500 0676 0002 f144 0009 968a 0500 0389
2103500  0002 f0bc 0009 969d 0500 0376 0002 ffe0 0009 96b0 0500 00a2 0002 f7f4 0009 96bc 0500 0081 0002 e180 0009 96c8 0500 085b
2103560  0002 f39c 0009 96df 0500 00d8 0002 ecc8 0009 96ef 0700 055f 0004 3294 0009 96ff 0500 04fe 0002 e2d0 0009 970f 0500 0123
2103640  0002 f610 0009 971a 0500 036a 0002 f694 0009 972d 0500 0259 0002 f420 0009 9739 0500 0665 0003 1078 0009 9746 0500 00da
2103720  0003 0f7c 0009 9757 0500 034f 0003 174c 0009 9767 0500 0794 0003 0f04 0009 9775 0500 024a 0003 1b8c 0009 978d 0500 0133
2104000  0003 0450 0009 97a3 0500 0245 0003 04a0 0009 97b2 0500 06b0 0003 0830 0009 97c6 0500 03dd 0003 1400 0009 97e1 0500 0669
2104060  0003 19f0 0009 97f5 0500 069f 0003 1994 0009 9802 0500 079d 0003 18dc 0009 980f 0500 080a 0003 1880 0009 981c 0500 079e
2104140  0003 1824 0009 9829 0500 06ac 0003 1938 0009 9836 0500 081e 0003 1d90 0009 9847 0500 00dd 0003 15a0 0009 985c 0500 0879
2104220  0003 14b8 0009 9871 0500 061a 0003 162c 0009 9883 0500 0753 0003 1f78 0009 989d 0500 0127 0003 1f3c 0009 98b0 0500 0598
2104300  0003 1544 0009 98c3 0500 0793 0003 145c 0009 98d6 5f5f 4459 4e41 4d49 4300 6372 7430 2e6f 005f 5f63 7464 7432 3333 3237
2104360  2e6f 0049 4f4d 616e 2e6f 005f 7075 745f 5f37 6f73 7472 6561 6d46 6300 5f69 6f73 7472 6561 6d5f 696e 6974 002f 686f 6d65
2104440  2f6f 7361 7331 2f61 2f61 622f 7372 632f 6e65 776f 626a 6563 7473 2f70 726f 672f 432b 2b2e 3139 3036 372f 0049 4f4d 616e
2104520  2e63 0049 4f4d 616e 2e63 7879 0069 6e74 3a74 2830 2c31 293d 7228 302c 3129 3b2d 3231 3437 3438 3336 3438 3b32 3134 3734
2104600  3833 3634 373b 0063 6861 723a 7428 302c 3229 3d72 2830 2c32 293b 303b 3132 373b 006c 6f6e 673a 7428 302c 3329 3d72 2830
2104660  2c31 293b 2d32 3134 3734 3833 3634 383b 3231 3437 3438 3336 3437 3b00 7368 6f72 743a 7428 302c 3429 3d72 2830 2c31 293b
2104740  2d33 3237 3638 3b33 3237 3637 3b00 756e 7369 676e 6564 2063 6861 723a 7428 302c 3529 3d72 2830 2c31 293b 303b 3235 353b
```

| | | | | | | | | | | | | | | | | | | | | | | | | |
|---|---|---|---|---|---|---|---|---|---|---|---|---|---|---|---|---|---|---|---|---|---|---|---|---|
| 2105020 | 0075 | 6e73 | 6967 | 6e65 | 6420 | 7368 | 6f72 | 743a | 7428 | 302c | 3629 | 3d72 | 2830 | 2c31 | 293b | 303b | 3635 | 3533 | 353b | 0075 | 6e73 | 6967 | 6e65 | 6420 |
| 2105100 | 6c6f | 6e67 | 3a74 | 2830 | 2c37 | 293d | 7228 | 302c | 3129 | 3b30 | 3b2d | 313b | 0075 | 6e73 | 6967 | 6e65 | 6420 | 696e | 743a | 7428 | 302c | 3829 | 3d72 | 2830 |
| 2105160 | 2c31 | 293b | 303b | 2d31 | 3b00 | 666c | 6f61 | 743a | 7428 | 302c | 3929 | 3d72 | 2830 | 2c31 | 293b | 343b | 303b | 0064 | 6f75 | 626c | 653a | 7428 | 302c | 3130 |
| 2105240 | 293d | 7228 | 302c | 3129 | 3b38 | 3b30 | 3b00 | 766f | 6964 | 3a74 | 2830 | 2c31 | 3129 | 3d28 | 302c | 3131 | 2900 | 3f3f | 3f3a | 7428 | 302c | 3132 | 293d | 2830 |
| 2105320 | 2c31 | 2900 | 5f5f | 7670 | 7470 | 3a74 | 2830 | 2c31 | 3329 | 3d2a | 2830 | 2c31 | 3429 | 3d66 | 2830 | 2c31 | 2900 | 5f5f | 6d70 | 7472 | 3a54 | 2830 | 2c31 | 3529 |
| 2105400 | 3d73 | 3864 | 3a28 | 302c | 3429 | 2c30 | 2c31 | 363b | 693a | 2830 | 2c34 | 292c | 3136 | 2c31 | 363b | 663a | 2830 | 2c31 | 3329 | 2c33 | 322c | 3332 | 3b3b | 005f |
| 2105460 | 5046 | 565f | 3a74 | 2830 | 2c31 | 3629 | 3d2a | 2830 | 2c31 | 3729 | 3d66 | 2830 | 2c32 | 2900 | 5f50 | 4649 | 5f3a | 7428 | 302c | 3133 | 2900 | 7374 | 7265 | 616d |
| 2105540 | 706f | 733a | 7428 | 302c | 3129 | 0073 | 7472 | 6561 | 6d6f | 6666 | 3a74 | 2830 | 2c31 | 2900 | 696f | 5f73 | 7461 | 7465 | 3a54 | 2830 | 2c31 | 3829 | 3d65 | 676f |
| 2105620 | 6f64 | 6269 | 745f | 5f69 | 6f5f | 7374 | 6174 | 653a | 302c | 656f | 6662 | 6974 | 5f5f | 696f | 5f73 | 7461 | 7465 | 3a31 | 2c66 | 6169 | 6c62 | 6974 | 5f5f | 696f |
| 2105700 | 5f73 | 7461 | 7465 | 3132 | 2c62 | 6164 | 6269 | 745f | 5f69 | 6f5f | 7374 | 6174 | 653a | 332c | 6861 | 7264 | 6661 | 696c | 5f5f | 696f | 5f73 | 7461 | 7465 | 3a34 |
| 2105760 | 2c3b | 006f | 7065 | 6e5f | 6d6f | 6465 | 3a54 | 2830 | 2c31 | 3929 | 3d65 | 696e | 5f5f | 6f70 | 656e | 5f6d | 6f64 | 653a | 302c | 6f75 | 745f | 5f6f | 7065 | 6e5f |
| 2106040 | 6d6f | 6465 | 3a31 | 2c61 | 7465 | 5f5f | 6f70 | 656e | 5f6d | 6f64 | 653a | 322c | 6170 | 705f | 5f6f | 7065 | 6e5f | 6d6f | 6465 | 3a33 | 2c74 | 7275 | 6e63 | 5f5f |
| 2106120 | 6f70 | 656e | 5f6d | 6f64 | 653a | 342c | 6e6f | 6372 | 6561 | 7465 | 5f5f | 6f70 | 656e | 5f6d | 6f64 | 653a | 352c | 6e6f | 7265 | 706c | 6163 | 655f | 5f6f | 7065 |
| 2106200 | 6e5f | 6d6f | 6465 | 3a36 | 2c3b | 0073 | 6565 | 6b5f | 6469 | 723a | 5428 | 302c | 3230 | 293d | 6562 | 6567 | 5f5f | 7365 | 656b | 5f64 | 6972 | 3a30 | 2c63 | 7572 |
| 2106260 | 5f5f | 7365 | 656b | 5f64 | 6972 | 3a31 | 2c65 | 6e64 | 5f5f | 7365 | 656b | 5f64 | 6972 | 3a32 | 2c3b | 005f | 5f45 | 313a | 5428 | 302c | 3231 | 293d | 6573 | 6b69 |
| 2106340 | 7077 | 735f | 5f5f | 5f45 | 313a | 302c | 6c65 | 6674 | 5f5f | 5f5f | 4531 | 3a31 | 2c72 | 6967 | 6874 | 5f5f | 5f5f | 4531 | 3a32 | 2c69 | 6e74 | 6572 | 6e61 | 6c5f |
| 2106420 | 5f5f | 5f45 | 313a | 332c | 6465 | 635f | 5f5f | 5f45 | 313a | 342c | 6f63 | 745f | 5f5f | 5f45 | 313a | 352c | 6865 | 785f | 5f5f | 5f45 | 313a | 362c | 7368 | 6f77 |
| 2106500 | 6261 | 7365 | 5f5f | 5f5f | 4531 | 3a37 | 2c5c | 0073 | 686f | 7770 | 6f69 | 6e74 | 5f5f | 5f5f | 4531 | 3a38 | 2c75 | 7070 | 6572 | 6361 | 7365 | 5f5f | 5f5f | 4531 |
| 2106560 | 3a39 | 2c73 | 686f | 7770 | 6f73 | 5f5f | 5f5f | 4531 | 3a31 | 302c | 7363 | 6965 | 6e74 | 6966 | 6963 | 5f5f | 5f5f | 4531 | 3a31 | 312c | 6669 | 7865 | 645f | 5f5f |
| 2106640 | 5f45 | 313a | 3132 | 2c75 | 6e69 | 7462 | 7566 | 5f5f | 5f5f | 4531 | 3a31 | 332c | 7374 | 6469 | 6f5f | 5f5f | 5f45 | 313a | 3134 | 2c3b | 005f | 5f45 | 323a | 5428 |
| 2106720 | 302c | 3232 | 293d | 6573 | 6b69 | 7070 | 696e | 675f | 5f5f | 5f45 | 323a | 302c | 7469 | 6564 | 5f5f | 5f5f | 4532 | 3a31 | 2c3b | 0069 | 6f73 | 3a54 | 2830 | 2c32 |
| 2107000 | 3329 | 3d73 | 3630 | 6e75 | 7365 | 725f | 5f33 | 696f | 733a | 2830 | 2c31 | 292c | 302c | 3332 | 3b78 | 5f75 | 7365 | 725f | 5f33 | 696f | 733a | 2830 | 2c32 | 3729 |
| 2107060 | 3d2a | 2830 | 2c32 | 3429 | 3d78 | 7569 | 6f73 | 5f75 | 7365 | 725f | 756e | 696f | 6e3a | 2c33 | 322c | 3332 | 3b62 | 705f | 5f33 | 696f | 733a | 2830 | 2c32 | 3829 |
| 2107140 | 3d2a | 2830 | 2c32 | 3529 | 3d78 | 7373 | 7472 | 6561 | 6d62 | 7566 | 3a2c | 3634 | 2c33 | 323b | 7374 | 6174 | 655f | 5f33 | 696f | 733a | 2830 | 2c31 | 292c | 3936 |
| 2107220 | 2c33 | 323b | 6973 | 7065 | 6369 | 616c | 5f5f | 3369 | 6f73 | 3a28 | 302c | 3129 | 2c31 | 3238 | 2c33 | 323b | 6f73 | 7065 | 6369 | 616c | 5f5f | 3369 | 6f73 | 3a28 |
| 2107300 | 302c | 3129 | 2c31 | 3630 | 2c33 | 323b | 6973 | 6678 | 5f73 | 7065 | 6369 | 616c | 5f5f | 3369 | 6f73 | 3a28 | 302c | 3129 | 2c31 | 3932 | 2c33 | 323b | 6f73 | 6678 |
| 2107360 | 5f73 | 7065 | 6369 | 616c | 5f5f | 3369 | 6f73 | 3a28 | 302c | 3129 | 2c32 | 3234 | 2c33 | 323b | 5c00 | 6465 | 6c62 | 7566 | 5f5f | 3369 | 6f73 | 3a28 | 302c | 3129 |
| 2107440 | 2c32 | 3536 | 2c33 | 323b | 785f | 7469 | 655f | 5f33 | 696f | 733a | 2830 | 2c32 | 3929 | 3d2a | 2830 | 2c32 | 3629 | 3d78 | 736f | 7374 | 7265 | 616d | 3a2c | 3238 |
| 2107520 | 382c | 3332 | 3b78 | 5f66 | 6c61 | 6773 | 5f5f | 3369 | 6f73 | 3a28 | 302c | 3129 | 2c33 | 3230 | 2c33 | 323b | 785f | 7072 | 6563 | 6973 | 696f | 6e5f | 5f33 | 696f |
| 2107600 | 733a | 2830 | 2c34 | 292c | 3335 | 322c | 3136 | 3b78 | 5f66 | 696c | 6c5f | 5f33 | 696f | 733a | 2830 | 2c32 | 292c | 3336 | 382c | 383b | 785f | 7769 | 6474 | 685f |
| 2107660 | 5f33 | 696f | 733a | 2830 | 2c34 | 292c | 3338 | 342c | 3136 | 3b61 | 7373 | 6967 | 6e5f | 7072 | 6976 | 6174 | 655f | 5f33 | 696f | 733a | 2830 | 2c31 | 292c | 3431 |
| 2107740 | 362c | 3332 | 3b5f | 5f76 | 7074 | 725f | 5f33 | 696f | 733a | 2830 | 2c33 | 3029 | 3d2a | 2830 | 2c31 | 3529 | 2c34 | 3438 | 2c33 | 323b | 3b00 | 6261 | 7365 | 6669 |
| 2110020 | 656c | 645f | 5f33 | 696f | 733a | 4728 | 302c | 3129 | 0061 | 646a | 7573 | 7466 | 6965 | 6c64 | 5f5f | 3369 | 6f73 | 3a47 | 2830 | 2c31 | 2900 | 666c | 6f61 | 7466 |
| 2110100 | 6965 | 6c64 | 5f5f | 3369 | 6f73 | 3a47 | 2830 | 2c31 | 2900 | 6e65 | 7874 | 6269 | 745f | 5f33 | 696f | 733a | 4728 | 302c | 3129 | 006e | 6578 | 7477 | 6f72 | 645f |
| 2110160 | 5f33 | 696f | 733a | 4728 | 302c | 3129 | 0073 | 7464 | 696f | 666c | 7573 | 685f | 5f33 | 696f | 733a | 4728 | 302c | 3136 | 2900 | 696f | 733a | 5a63 | 696f | 733b |
| 2110240 | 3b5f | 5f63 | 745f | 5f33 | 696f | 7346 | 5039 | 7374 | 7265 | 616d | 6275 | 6620 | 5f5f | 6374 | 5f5f | 3369 | 6f73 | 4676 | 205f | 5f63 | 745f | 5f33 | 696f | 7346 |
| 2110320 | 5233 | 696f | 7320 | 5f5f | 6474 | 5f5f | 3369 | 6f73 | 4676 | 2066 | 6c61 | 6773 | 5f5f | 3369 | 6f73 | 4676 | 2066 | 6c61 | 6773 | 5f5f | 3369 | 6f73 | 466c | 2073 |
| 2110400 | 6574 | 665f | 5f33 | 696f | 7346 | 6c54 | 3120 | 7365 | 7466 | 5f5f | 3369 | 6f73 | 466c | 2075 | 6e73 | 6574 | 665f | 5f33 | 696f | 7346 | 6c20 | 7769 | 6474 | 685f |
| 2110460 | 5f33 | 696f | 7346 | 7620 | 7769 | 6474 | 685f | 5f33 | 696f | 7346 | 6920 | 7469 | 655f | 5f33 | 696f | 7346 | 5037 | 6f73 | 7472 | 6561 | 6d20 | 5c00 | 7469 | 655f |
| 2110540 | 5f33 | 696f | 7346 | 7620 | 6669 | 6c6c | 5f5f | 3369 | 6f73 | 4663 | 2066 | 696c | 6c5f | 5f33 | 696f | 7346 | 7620 | 7072 | 6563 | 6973 | 696f | 6e5f | 5f33 | 696f |
| 2110620 | 7346 | 6920 | 7072 | 6563 | 6973 | 696f | 6e5f | 5f33 | 696f | 7346 | 7620 | 7264 | 7374 | 6174 | 655f | 5f33 | 696f | 7346 | 7620 | 5f5f | 6f70 | 5076 | 5f5f | 3369 |
| 2110700 | 6f73 | 4676 | 205f | 5f6e | 745f | 5f33 | 696f | 7346 | 7620 | 656f | 665f | 5f33 | 696f | 7346 | 7620 | 6661 | 696c | 5f5f | 3369 | 6f73 | 4676 | 2062 | 6164 | 5f5f |
| 2110760 | 3369 | 6f73 | 4676 | 2067 | 6f6f | 645f | 5f33 | 696f | 7346 | 7620 | 636c | 6561 | 725f | 5f33 | 696f | 7346 | 6920 | 7264 | 6275 | 665f | 5f33 | 696f | 7346 | 7620 |
| 2111040 | 5c00 | 6977 | 6f72 | 645f | 5f33 | 696f | 7346 | 6920 | 7077 | 6f72 | 645f | 5f33 | 696f | 7346 | 6920 | 6269 | 7461 | 6c6c | 6f63 | 5f5f | 3369 | 6f73 | 5346 | 7620 |
| 2111120 | 7861 | 6c6c | 6f63 | 5f5f | 3369 | 6f73 | 5346 | 7620 | 7572 | 6573 | 697a | 655f | 5f33 | 696f | 7346 | 6920 | 7379 | 6e63 | 5f77 | 6974 | 685f | 7374 | 6469 | 6f5f |
| 2111200 | 5f33 | 696f | 7353 | 4676 | 2073 | 6574 | 7374 | 6174 | 655f | 5f33 | 696f | 7346 | 6920 | 696e | 6974 | 5f5f | 3369 | 6f73 | 4650 | 3973 | 7472 | 6561 | 6d62 | 7566 |
| 2111260 | 205f | 5f61 | 735f | 5f33 | 696f | 7346 | 5233 | 696f | 7320 | 736b | 6970 | 5f5f | 3369 | 6f73 | 4669 | 203b | 6261 | 7365 | 6669 | 656c | 645f | 5f33 | 696f | 7320 |
| 2111340 | 5c00 | 6164 | 6a75 | 7374 | 6669 | 656c | 645f | 5f33 | 696f | 7320 | 666c | 6f61 | 7466 | 6965 | 6c64 | 5f5f | 3369 | 6f73 | 206e | 6578 | 7462 | 6974 | 5f5f | 3369 |
| 2111420 | 6f73 | 206e | 6578 | 7477 | 6f72 | 645f | 5f33 | 696f | 7320 | 7374 | 6469 | 6f66 | 6c75 | 7368 | 5f5f | 3369 | 6f73 | 203b | 3b00 | 7374 | 7265 | 616d | 6275 | 663a |
| 2111500 | 5428 | 302c | 3235 | 293d | 7334 | 3061 | 6c6c | 6f63 | 5f5f | 3973 | 7472 | 6561 | 6d62 | 7566 | 3a28 | 302c | 3429 | 2c30 | 2c31 | 363b | 785f | 756e | 6275 | 665f |
| 2111560 | 5f39 | 7374 | 7265 | 616d | 6275 | 663a | 2830 | 2c34 | 292c | 3136 | 2c31 | 363b | 785f | 6261 | 7365 | 5f5f | 3973 | 7472 | 6561 | 6d62 | 7566 | 3a28 | 302c | 3331 |
| 2111640 | 293d | 2a28 | 302c | 3229 | 2c33 | 322c | 3332 | 3b78 | 5f70 | 6261 | 7365 | 5f5f | 3973 | 7472 | 6561 | 6d62 | 7566 | 3a28 | 302c | 3331 | 292c | 3634 | 2c33 | 323b |
| 2111720 | 785f | 7070 | 7472 | 5f5f | 3973 | 7472 | 6561 | 6d62 | 7566 | 3a28 | 302c | 3331 | 292c | 3936 | 2c33 | 323b | 785f | 6570 | 7074 | 725f | 5f39 | 7374 | 7265 | 616d |
| 2112000 | 6275 | 663a | 2830 | 2c33 | 3129 | 2c31 | 3238 | 2c33 | 323b | 785f | 6770 | 7472 | 5f5f | 3973 | 7472 | 6561 | 6d62 | 7566 | 3a28 | 302c | 3331 | 292c | 3136 | 302c |
| 2112060 | 3332 | 3b78 | 5f65 | 6770 | 7472 | 5f5f | 3973 | 7472 | 6561 | 6d62 | 7566 | 3a28 | 302c | 3331 | 292c | 3139 | 322c | 3332 | 3b5c | 0078 | 5f65 | 6261 | 636b | 5f5f |

```
2112140 3973 7472 6561 6462 7566 3a28 302c 3331 292c 3232 342c 3332 3b78 5f62 6c65 6e5f 5f39 7374 7265 616d 6275 663a 2830 2c31
2112220 292c 3235 362c 3332 3b5f 5f76 7074 725f 5f39 7374 7265 616d 6275 663a 2830 2c33 3029 2c32 3838 2c33 323b 3b00 7374 7265
2112300 616d 6275 663a 5a63 7374 7265 616d 6275 663b 3b5f 5f63 745f 5f39 7374 7265 616d 6275 6646 5239 7374 7265 616d 6275 6620
2112360 5f5f 6374 5f5f 3973 7472 6561 6d62 7566 4676 205f 5f63 745f 5f39 7374 7265 616d 6275 6646 5063 6920 5f5f 6374 5f5f 3973
2112440 7472 6561 6d62 7566 4650 6369 5432 205f 5f61 735f 5f39 7374 7265 616d 6275 6646 5239 7374 7265 616d 6275 6620 6462 705f
2112520 5f39 7374 7265 616d 6275 6646 7620 6261 7365 5f5f 3973 7472 6561 6d62 7566 4676 2070 6261 7365 5f5f 3973 7472 6561 6d62
2112600 7566 4676 205c 0070 7074 725f 5f39 7374 7265 616d 6275 6646 7620 6570 7074 725f 5f39 7374 7265 616d 6275 6646 7620 6770
2112660 7472 5f5f 3973 7472 6561 6d62 7566 4676 2065 6770 7472 5f5f 3973 7472 6561 6d62 7566 4676 2065 6261 636b 5f5f 3973 7472
2112740 6561 6d62 7566 4676 2065 6275 665f 5f39 7374 7265 616d 6275 6646 7620 626c 656e 5f5f 3973 7472 6561 6d62 7566 4676 2073
2113020 6574 705f 5f39 7374 7265 616d 6275 6646 5063 5431 2073 6574 675f 5f39 7374 7265 616d 6275 6646 5063 4e32 3120 7062 756d
2113100 705f 5f39 7374 7265 616d 6275 6646 6920 5c00 6762 756d 705f 5f39 7374 7265 6164 6275 6646 6920 7365 7462 5f5f 3973 7472
2113160 6561 6d62 7566 4650 6354 3169 2075 6e62 7566 6665 7265 645f 5f39 7374 7265 616d 6275 6646 7620 756e 6275 6666 6572 6564
2113240 5f5f 3973 7472 6561 6d62 7566 4669 2061 6c6c 6f63 6174 655f 5f39 7374 7265 616d 6275 6646 7620 646f 616c 6c6f 6361 7465
2113320 5f5f 3973 7472 6561 6d62 7566 4676 206f 7665 7266 6c6f 775f 5f39 7374 7265 616d 6275 6646 6920 756e 6465 7266 6c6f 775f
2113400 5f39 7374 7265 616d 6275 6646 7620 5c00 7062 6163 6b66 6169 6c5f 5f39 7374 7265 6163 6275 6646 6920 7379 6e63 5f5f 3973
2113460 7472 6561 6d62 7566 4676 2073 6565 6b6f 6666 5f5f 3973 7472 6561 6d62 7566 466c 3873 6565 6b5f 6469 7269 2073 6565 6b70
2113540 6f73 5f5f 3973 7472 6561 6d62 7566 466c 6920 7873 7075 746e 5f5f 3973 7472 6561 6d62 7566 4650 4363 6920 7873 6765 746e
2113620 5f5f 3973 7472 6561 6d62 7566 4650 6369 2069 6e5f 6176 6169 6c5f 5f39 7374 7265 616d 6275 6646 7620 6f75 745f 7761 6974
2113700 696e 675f 5f39 7374 7265 616d 6275 6646 7620 5c00 7367 6574 635f 5f39 7374 7265 616d 6275 6646 7620 736e 6578 7463 5f5f
2113760 3973 7472 6561 6462 7566 4676 2073 6275 6d70 635f 5f39 7374 7265 6161 6275 6646 7620 7374 6f73 7363 5f5f 3973 7472 6561
2114040 6d62 7566 4676 2073 7075 7462 6163 6b63 5f5f 3973 7472 6561 6d62 7566 4663 2073 7075 7463 5f5f 3973 7472 6561 6d62 7566
2114120 4669 2073 7075 746e 5f5f 3973 7472 6561 6d62 7566 4650 4363 6920 7367 6574 6e5f 5f39 7374 7265 616d 6275 6646 5063 6920
2114200 7365 7462 7566 5f5f 3973 7472 6561 6d62 7566 4650 6369 205c 0073 6574 6275 665f 5f39 7374 7265 616d 6275 6646 5055 6369
2114260 2073 6574 6275 665f 5f39 7374 7265 616d 6275 6646 5063 6954 3220 5f5f 6474 5f5f 3973 7472 6561 6d62 7566 4676 2078 5f73
2114340 6e65 7874 635f 5f39 7374 7265 616d 6275 6646 7620 3b3b 3b00 6973 7472 6561 6d3a 5428 302c 3332 293d 7337 3278 5f67 636f
2114420 756e 745f 5f37 6973 7472 6561 6d3a 2830 2c31 292c 302c 3332 3b5f 5f76 7074 725f 5f37 6973 7472 6561 6d3a 2830 2c33 3029
2114500 2c33 322c 3332 3b50 696f 733a 2830 2c33 3329 3d2a 2830 2c32 3329 2c36 342c 3332 3b4f 696f 733a 2930 2c32 3329 2c39 362c
2114560 3438 303b 3b00 6973 7472 6561 6d3a 5a63 6973 7472 6561 6d3b 696f 733b 5f5f 6374 5f5f 3769 7374 7265 616d 4650 3973 7472
2114640 6561 6d62 7566 235f 5f63 745f 5f37 6973 7472 6561 6d46 7620 5f5f 6374 5f5f 3769 7374 7265 616d 4650 3973 7472 6561 6d62
2114720 7566 6950 376f 7374 7265 616d 205f 5f63 745f 5f37 6973 7472 6561 6d46 6950 6354 3120 5f5f 6374 5f5f 3769 7374 7265 616d
2115000 4669 5431 5037 6f73 7472 6561 6d20 5f5f 6374 5f5f 3769 7374 7265 616d 4652 3769 7374 7265 616d 205f 5f64 745f 5f37 6973
2115060 7472 6561 6d46 7620 5c00 6970 6678 5f5f 3769 7374 7265 616d 4669 2069 7366 785f 5f37 6973 7472 6561 6d46 7620 7365 656b
2115140 675f 5f37 6973 7472 6561 6d46 6c20 7365 656b 675f 5f37 6973 7472 6561 6d46 6c38 7365 656b 5f64 6972 2074 656c 6c67 5f5f
2115220 3769 7374 7265 616d 4676 205f 5f72 735f 5f37 6973 7472 6561 6d46 5046 5237 6973 7472 6561 6d5f 5237 6973 7472 6561 6d20
2115300 5f5f 7273 5f5f 3769 7374 7265 616d 4650 4652 3369 6f73 5f52 3369 6f73 205f 5f72 735f 5f37 6973 7472 6561 6d46 5063 205f
2115360 5f72 735f 5f37 6973 7472 6561 6d46 5055 6320 5c00 5f5f 7273 5f5f 3769 7374 7265 616d 4652 5563 205f 5f72 735f 5f37 6973
2115440 7472 6561 6d46 5263 205f 5f72 735f 5f37 6973 7472 6561 6346 5273 205f 5f72 735f 5f37 6973 7472 6561 6d46 5269 205f 5f72
2115520 735f 5f37 6973 7472 6561 6d46 526c 205f 5f72 735f 5f37 6973 7472 6561 6d46 5255 7320 5f5f 7273 5f5f 3769 7374 7265 616d
2115600 4652 5569 205f 5f72 735f 5f37 6973 7472 6561 6d46 5255 6c20 5f5f 7273 5f5f 3769 7374 7265 616d 4652 6620 5f5f 7273 5f5f
2115660 3769 7374 7265 616d 4652 6420 5f5f 7273 5f5f 3769 7374 7265 616d 4650 3973 7472 6561 6d62 7566 205c 0067 6574 5f5f 3769
2115740 7374 7265 616d 4650 6369 6320 6765 745f 5f37 6973 7472 6561 6d46 5055 6369 6320 6765 745f 5f37 6973 7472 6561 6d46 5239
2116020 7374 7265 616d 6275 6663 2067 6574 5f5f 3769 7374 7265 616d 4652 5563 2067 6574 5f5f 3769 7374 7265 616d 4652 6320 6765
2116100 745f 5f37 6973 7472 6561 6d46 7620 6765 746c 696e 655f 5f37 6973 7472 6561 6d46 5063 6963 2067 6574 6c69 6e65 5f5f 3769
2116160 7374 7265 616d 4650 5563 6963 2070 6565 6b5f 5f37 6973 7472 6561 6d46 7620 6967 6e6f 7265 5f5f 3769 7374 7265 616d 4669
2116240 5431 205c 0072 6561 645f 5f37 6973 7472 6561 6346 5063 6920 7265 6164 5f5f 3769 7374 7265 616d 4650 5563 6920 6763 6f75
2116320 6e74 5f5f 3769 7374 7265 616d 4676 2070 7574 6261 636b 5f5f 3769 7374 7265 616d 4663 2073 796e 635f 5f37 6973 7472 6561
2116400 6d46 7620 646f 5f69 7066 785f 5f37 6973 7472 6561 6d46 6920 6561 7477 6869 7465 5f5f 3769 7374 7265 616d 4676 2078 6765
2116460 745f 5f37 6973 7472 6561 6d46 5063 203b 3b3b 006f 7374 7265 616d 3a54 2830 2c32 3629 3d73 3638 5f5f 7670 7472 5f5f 376f
2116540 7374 7265 616d 3a28 302c 3339 292c 302c 3332 3b50 696f 733a 2830 2c33 3329 2c33 322c 3332 3b4f 696f 733a 2830 2c32 3329
2116620 2c36 342c 3438 303b 3b00 6f73 7472 6561 6d3a 5a63 6f73 7472 6561 6d3b 696f 733b 5f5f 6374 5f5f 376f 7374 7265 616d 4650
2116700 3973 7472 6561 6d62 7566 205f 5f63 745f 5f37 6f73 7472 6561 6146 7620 5f5f 6374 5f5f 376f 7374 7265 616d 4669 205f 5f63
2116760 745f 5f37 6f73 7472 6561 6d46 6950 6320 5f5f 6374 5f5f 376f 7374 7265 616d 4652 376f 7374 7265 616d 205f 5f64 745f 5f37
2117040 6f73 7472 6561 6146 7620 6f70 6678 5f5f 376f 7374 7265 616d 4676 206f 7366 785f 5f37 6f73 7472 6561 6d46 7620 666c 7573
2117120 685f 5f37 6f73 7472 6561 6d46 7620 5c00 7365 656b 705f 5f37 6f73 7472 6561 6d46 6c20 7365 656b 705f 5f37 6f73 7472 6561
2117200 6d46 6c38 7365 656b 5f64 6972 2074 656c 6c70 5f5f 376f 7374 7265 616d 4676 2070 7574 5f5f 376f 7374 7265 616d 4663 205f
```

```
2117260 5f6c 735f 5f37 6f73 7472 6561 6d46 6320 5f5f 6c73 5f5f 376f 7374 7265 616d 4655 6320 5f5f 6c73 5f5f 376f 7374 7265 616d
2117340 4650 4363 205f 5f6c 735f 5f37 6f73 7472 6561 6d46 6920 5f5f 6c73 5f5f 376f 7374 7265 616d 466c 205f 5f6c 735f 5f37 6f73
2117420 7472 6561 6d46 6420 5f5f 6c73 5f5f 376f 7374 7265 616d 4666 205c 005f 5f6c 735f 5f37 6f73 7472 6561 6d46 5569 205f 5f6c
2117500 735f 5f37 6f73 7472 6561 6d46 556c 205f 5f6c 735f 5f37 6f73 7472 6561 6d46 5076 205f 5f6c 735f 5f37 6f73 7472 6561 6d46
2117560 5039 7374 7265 616d 6275 6620 5f5f 6c73 5f5f 376f 7374 7265 616d 4673 205f 5f6c 735f 5f37 6f73 7472 6561 6d46 5573 205f
2117640 5f6c 735f 5f37 6f73 7472 6561 6d46 5046 5237 6f73 7472 6561 6d5f 5237 6f73 7472 6561 6d20 5f5f 6c73 5f5f 376f 7374 7265
2117720 616d 4650 4652 3369 6f73 5f52 3369 6f73 2077 7269 7465 5f5f 376f 7374 7265 616d 4650 4363 6920 5c00 7772 6974 655f 5f37
2120000 6f73 7472 6561 6d46 5043 5563 6920 646f 5f6f 7066 785f 5f37 6f73 7472 6561 6d46 7620 646f 5f6f 7366 785f 5f37 6f73 7472
2120060 6561 6d46 7620 3b3b 3b00 7075 745f 5f37 6f73 7472 6561 6d46 633a 6628 302c 3334 293d 2a28 302c 3236 2900 5f5f 3074 6869
2120140 733a 7028 302c 3334 2900 5f5f 3063 3a70 2830 2c32 2900 2f75 7372 2f43 432f 7375 6e34 2f69 6e63 6c2f 696f 7374 7265 616d
2120220 2e68 005f 5f30 7468 6973 3a72 2830 2c33 3429 005f 5f30 7468 6973 203a 5a74 6c00 5f5f 3063 203a 5a74 6c00 7075 745f 5f37
2120300 6f73 7472 6561 6d46 6320 3a5a 7446 0069 6f73 7472 6561 6d3a 5428 302c 3335 293d 7338 3078 5f67 636f 756e 745f 5f37 6973
2120360 7472 6561 6d3a 2830 2c31 292c 302c 3332 3b5f 5f76 7074 725f 5f37 6973 7472 6561 6d3a 2830 2c33 3029 2c33 322c 3332 3b50
2120440 696f 733a 2830 2c33 3329 2c36 342c 3332 3b4f 6f73 7472 6561 6d3a 2830 2c32 3629 2c39 362c 3534 343b 3b00 696f 7374 7265
2120520 616d 3a5a 6369 6f73 7472 6561 6d3b 6973 7472 6561 6d20 6f73 7472 6561 6d20 696f 733b 5f5f 6374 5f5f 3869 6f73 7472 6561
2120600 6d46 5039 7374 7265 616d 6275 6620 5f5f 6374 5f5f 3869 6f73 7472 6561 6d46 7620 5f5f 6374 5f5f 3869 6f73 7472 6561 6d46
2120660 5238 696f 7374 7265 616d 205f 5f64 745f 5f38 696f 7374 7265 616d 4676 203b 3b3b 0063 696e 3a47 2830 2c33 3629 3d78 7369
2120740 7374 7265 616d 5f77 6974 6861 7373 6967 6e3a 0063 6f75 743a 4728 302c 3337 293d 7873 6f73 7472 6561 6d5f 7769 7468 6173
2121020 7369 676e 3a00 6365 7272 3a47 2830 2c33 3729 0063 6c6f 673a 4728 302c 3337 2900 496f 7374 7265 616d 5f69 6e69 743a 5428
2121100 302c 3338 293d 7331 5f5f 5739 5f5f 3133 496f 7374 7265 616d 5f69 6e69 743a 2830 2c32 292c 302c 383b 3b00 7374 6473 7461
2121160 7475 735f 5f31 3349 6f73 7472 6561 6d5f 696e 6974 3a47 2830 2c31 2900 696e 6974 636f 756e 745f 5f31 3349 6f73 7472 6561
2121240 6d5f 696e 6974 3a47 2830 2c31 2900 496f 7374 7265 616d 5f69 6e69 743a 5a63 496f 7374 7265 616d 5f69 6e69 743b 3b5f 5f63
2121320 745f 5f31 3349 6f73 7472 6561 6d5f 696e 6974 4676 205f 5f64 745f 5f31 3349 6f73 7472 6561 6d5f 696e 6974 4676 203b 7374
2121400 6473 7461 7475 735f 5f31 3349 6f73 7472 6561 6d5f 696e 6974 2069 6e69 7463 6f75 6e74 5f5f 3133 496f 7374 7265 616d 5f69
2121460 6e69 7420 3b40 696f 733b 0069 6f73 7472 6561 6d5f 696e 6974 3a53 2830 2c33 3829 0047 5054 3a74 2830 2c31 3329 0073 6d61
2121540 6e69 705f 696e 743a 5428 302c 3339 293d 7338 6663 745f 5f31 3073 6d61 6e69 705f 696e 743a 2830 2c34 3029 3d2a 2830 2c34
2121620 3129 3d66 2830 2c33 3329 2c30 2c33 323b 6172 675f 5f31 3073 6d61 6e69 705f 696e 743a 2839 2c31 292c 3332 2c33 323b 3b00
2121700 736d 616e 6970 5f69 6e74 3a5a 6373 6d61 6e69 705f 696e 743b 3b5f 5f63 745f 5f31 3073 6d61 6e69 705f 696e 7446 5046 5233
2121760 696f 7369 5f52 3369 6f73 6920 3b3b 5f5f 6c73 5f5f 4652 376f 7374 7265 616d 5231 3073 6d61 6e69 705f 696e 7420 5f5f 7273
2122040 5f5f 4652 3769 7374 7265 616d 5231 3073 6d61 6e69 705f 696e 7420 3b00 7361 7070 6c79 5f69 6e74 3a54 2830 2c34 3229 3d73
2122120 3466 6374 5f5f 3130 7361 7070 6c79 5f69 6e74 3a28 302c 3430 292c 302c 3332 3b3b 0073 6170 706c 795f 696e 743a 5a63 7361
2122200 7070 6c79 5f69 6e74 3b3b 5f5f 6374 5f5f 3130 7361 7070 6c79 5f69 6e74 4650 4652 3369 6f73 695f 5233 696f 7320 5f5f 636c
2122260 5f5f 3130 7361 7070 6c79 5f69 6e74 4669 203b 3b3b 0069 6d61 6e69 705f 696e 743a 5428 302c 3433 293d 7338 6663 745f 5f31
2122340 3069 6d61 6e69 705f 696e 743a 2830 2c34 3429 3d2a 2830 2c34 3529 3d66 2830 2c34 3629 3d2a 2830 2c33 3229 2c30 2c33 323b
2122420 6172 675f 5f31 3069 6d61 6e69 705f 696e 743a 2830 2c31 292c 3332 2c33 323b 3b00 696d 616e 6970 5f69 6e74 3a5a 6369 6d61
2122500 6e69 705f 696e 743b 3b5f 5f63 745f 5f31 3069 6d61 6e69 705f 696e 7446 5046 5237 6973 7472 6561 6d69 5f52 3769 7374 7265
2122560 616d 6920 3b3b 5f5f 7273 5f5f 4652 3769 7374 7265 616d 5231 3069 6d61 6e69 705f 696e 7420 3b00 6961 7070 6c79 5f69 6e74
2122640 3a54 2830 2c34 3729 3d73 3466 6374 5f5f 3130 6961 7070 6c79 5f69 6e74 3a28 302c 3434 292c 302c 3332 3b3b 0069 6170 706c
2122720 795f 696e 743a 5a63 6961 7070 6c79 5f69 6e74 3b3b 5f5f 6374 5f5f 3130 6961 7070 6c79 5f69 6e74 4650 4652 3769 7374 7265
2123000 616d 695f 5237 6973 7472 6561 6d20 5f5f 636c 5f5f 3130 6961 7070 6c79 5f69 6e74 4669 203b 3b3b 006f 6d61 6e69 705f 696e
2123060 743a 5428 302c 3438 293d 7338 6663 745f 5f31 306f 6d61 6e69 705f 696e 743a 2830 2c34 3929 3d2a 2830 2c35 3029 3d66 2830
2123140 2c33 3429 2c30 2c33 323b 6172 675f 5f31 306f 6d61 6e69 705f 696e 743a 2830 2c31 292c 3332 2c33 323b 3b00 6f6d 616e 6970
2123220 5f69 6e74 3a5a 636f 6d61 6e69 705f 696e 743b 3b5f 5f63 745f 5f31 306f 6d61 6e69 705f 696e 7446 5046 5237 6f73 7472 6561
2123300 6d69 5f52 376f 7374 7265 616d 6920 3b3b 5f5f 6c73 5f5f 4652 376f 7374 7265 616d 5231 306f 6d61 6e69 705f 696e 7420 3b00
2123360 6f61 7070 6c79 5f69 6e74 3a54 2830 2c35 3129 3173 3466 6374 5f5f 3130 6f61 7070 6c79 5f69 6e74 3a28 302c 3439 292c 302c
2123440 3332 3b3b 006f 6170 706c 795f 696e 743a 5a63 6f61 7070 6c79 5f69 6e74 3b3b 5f5f 6374 5f5f 3130 6f61 7070 6c79 5f69 6e74
2123520 4650 4652 376f 7374 7265 616d 695f 5237 6f73 7472 6561 6d20 5f5f 636c 5f5f 3130 6f61 7070 6c79 5f69 6e74 4669 203b 3b3b
2123600 0069 6f6d 616e 6970 5f69 6e74 3a54 2830 2c35 3229 3d73 3866 6374 5f5f 3131 696f 6d61 6e69 705f 696e 743a 2830 2c35 3329
2123660 3d2a 2830 2c35 3429 3d66 2830 2c35 3529 3d2a 2830 2c33 3529 2c30 2c33 323b 6172 675f 5f31 3169 6f6d 616e 6970 5f69 6e74
2123740 3a28 302c 3129 2c33 322c 3332 3b3b 0069 6f6d 616e 6970 5f69 6e74 3a5a 6369 6f6d 616e 6970 5f69 6e74 3b3b 5f5f 6374 5f5f
2124020 3131 696f 6d61 6e69 705f 696e 7446 5046 5238 696f 7374 7265 616d 695f 5238 696f 7374 7265 616d 6920 3b3b 5f5f 6c73 5f5f
2124100 4652 3869 6f73 7472 6561 6d52 3131 696f 6d61 6e69 705f 696e 7420 5f5f 7273 5f5f 4652 3869 6f73 7472 6561 6d52 3131 696f
2124160 6d61 6e69 705f 696e 7420 3b00 696f 6170 706c 795f 696e 743a 5428 302c 3536 293d 7334 6663 745f 5f31 3169 6f61 7070 6c79
2124240 5f69 6e74 3a28 302c 3533 292c 302c 3332 3b3b 0069 6f61 7070 6c79 5f69 6e74 3a5a 6369 6f61 7070 6c79 5f69 6e74 3b3b 5f5f
2124320 6374 5f5f 3131 696f 6170 706c 795f 696e 7446 5046 5238 696f 7374 7265 616d 695f 5238 696f 7374 7265 616d 205f 5f63 6c5f
```

```
2124400 5f31 3169 6f61 7070 6c79 5f69 6e74 4669 203b 3b3b 0073 6d61 6e69 705f 6c6f 6e67 3a54 2830 2c35 3729 3d73 3866 6374 5f5f
2124460 3131 736d 616e 6970 5f6c 6f6e 673a 2830 2c34 3029 2c30 2c33 323b 6172 675f 5f31 3173 6d61 6e69 705f 6c6f 6e67 3a28 302c
2124540 3129 2c33 322c 3332 3b3b 0073 6d61 6e69 705f 6c6f 6e67 3a5a 6373 6d61 6e69 705f 6c6f 6e67 3b3b 5f5f 6374 5f5f 3131 736d
2124620 616e 6970 5f6c 6f6e 6746 5046 5233 696f 736c 5f52 3369 6f73 6c20 3b3b 5f5f 6c73 5f5f 4652 376f 7374 7265 616d 5231 3173
2124700 6d61 6e69 705f 6c6f 6e67 205f 5f72 735f 5f46 5237 6973 7472 6561 6d52 3131 736d 616e 6970 5f6c 6f6e 6720 3b00 7361 7070
2124760 6c79 5f6c 6f6e 673a 5428 302c 3538 293d 7334 6663 745f 5f31 3173 6170 706c 795f 6c6f 6e67 3a28 302c 3430 292c 302c 3332
2125040 3b3b 0073 6170 706c 795f 6c6f 6e67 3a5a 6373 6170 706c 795f 6c6f 6e67 3b3b 5f5f 6374 5f5f 3131 7361 7070 6c79 5f6c 6f6e
2125120 6746 5046 5233 696f 736c 5f52 3369 6f73 205f 5f63 6c5f 5f31 3173 6170 706c 795f 6c6f 6e67 466c 203b 3b3b 0069 6d61 6e69
2125200 705f 6c6f 6e67 3a54 2830 2c35 3929 3d73 3866 6374 5f5f 3131 696d 616e 6970 5f6c 6f6e 673a 2830 2c34 3429 2c30 2c33 323b
2125260 6172 675f 5f31 3169 6d61 6e69 705f 6c6f 6e67 3a28 302c 3129 2c33 322c 3332 3b3b 0069 6d61 6e69 705f 6c6f 6e67 3a5a 6369
2125340 6d61 6e69 705f 6c6f 6e67 3b3b 5f5f 6374 5f5f 3131 696d 616e 6970 5f6c 6f6e 6746 5046 5237 6973 7472 6561 6d6c 5f52 3769
2125420 7374 7265 616d 6c20 3b3b 5f5f 7273 5f5f 4652 3769 7374 7265 616d 5231 3169 6d61 6e69 705f 6c6f 6e67 203b 0069 6170 706c
2125500 795f 6c6f 6e67 3a54 2830 2c36 3029 3d73 3466 6374 5f5f 3131 6961 7070 6c79 5f6c 6f6e 673a 2830 2c34 3429 2c30 2c33 323b
2125560 3b00 6961 7070 6c79 5f6c 6f6e 673a 5a63 6961 7070 6c79 5f6c 6f6e 673b 3b5f 5f63 745f 5f31 3169 6170 706c 795f 6c6f 6e67
2125640 4650 4652 3769 7374 7265 616d 6c5f 5237 6973 7472 6561 6d20 5f5f 636c 5f5f 3131 6961 7070 6c79 5f6c 6f6e 6746 6c20 3b3b
2125720 3b00 6f6d 616e 6970 5f6c 6f6e 673a 5428 302c 3631 293d 7338 6663 745f 5f31 316f 6d61 6e69 705f 6c6f 6e67 3a28 302c 3439
2126000 292c 302c 3332 3b61 7267 5f5f 3131 6f6d 616e 6970 5f6c 6f6e 673a 2830 2c31 292c 3332 2c33 323b 3b00 6f6d 616e 6970 5f6c
2126060 6f6e 673a 5a63 6f6d 616e 6970 5f6c 6f6e 673b 3b5f 5f63 745f 5f31 316f 6d61 6e69 705f 6c6f 6e67 4650 4652 376f 7374 7265
2126140 616d 6c5f 5237 6f73 7472 6561 6d6c 203b 3b5f 5f6c 735f 5f46 5237 6f73 7472 6561 6d52 3131 6f6d 616e 6970 5f6c 6f6e 6720
2126220 3b00 6f61 7070 6c79 5f6c 6f6e 673a 5428 302c 3632 293d 7334 6663 745f 5f31 316f 6170 706c 795f 6c6f 6e67 3a28 302c 3439
2126300 292c 302c 3332 3b3b 006f 6170 706c 795f 6c6f 6e67 3a5a 636f 6170 706c 795f 6c6f 6e67 3b3b 5f5f 6374 5f5f 3131 6f61 7070
2126360 6c79 5f6c 6f6e 6746 5046 5237 6f73 7472 6561 6d6c 5f52 376f 7374 7265 616d 205f 5f63 6c5f 5f31 316f 6170 706c 795f 6c6f
2126440 6e67 466c 203b 3b3b 0069 6f6d 616e 6970 5f6c 6f6e 673a 5428 302c 3633 293d 7338 6663 745f 5f31 3269 6f6d 616e 6970 5f6c
2126520 6f6e 673a 2830 2c35 3329 2c30 2c33 323b 6172 675f 5f31 3269 6f6d 616e 6970 5f6c 6f6e 673a 2830 2c31 292c 3332 2c33 323b
2126600 3b00 696f 6d61 6e69 705f 6c6f 6e67 3a5a 6369 6f6d 616e 6970 5f6c 6f6e 673b 3b5f 5f63 745f 5f31 3269 6f6d 616e 6970 5f6c
2126660 6f6e 6746 5046 5238 696f 7374 7265 616d 6c5f 5238 696f 7374 7265 616d 6c20 3b3b 5f5f 6c73 5f5f 4652 3869 6f73 7472 6561
2126740 6d52 3132 696f 6d61 6e69 705f 6c6f 6e67 205f 5f72 735f 5f46 5238 696f 7374 7265 616d 5231 3269 6f6d 616e 6970 5f6c 6f6e
2127020 6720 3b00 696f 6170 706c 795f 6c6f 6e67 3a54 2830 2c36 3429 3d73 3466 6374 5f5f 3132 696f 6170 706c 795f 6c6f 6e67 3a28
2127100 302c 3533 292c 302c 3332 3b3b 0069 6f61 7070 6c79 5f6c 6f6e 673a 5a63 696f 6170 706c 795f 6c6f 6e67 3b3b 5f5f 6374 5f5f
2127160 3132 696f 6170 706c 795f 6c6f 6e67 4650 4652 3869 6f73 7472 6561 6d6c 5f52 3869 6f73 7472 6561 6d20 5f5f 636c 5f5f 3132
2127240 696f 6170 706c 795f 6c6f 6e67 466c 203b 3b3b 0065 7272 6e6f 3a47 2830 2c31 2900 7379 735f 6e65 7272 3a47 2830 2c31 2900
2127320 7374 6469 6f62 7566 3a54 2830 2c36 3629 3d73 3532 616c 6c6f 635f 5f39 7374 7265 616d 6275 663a 2830 2c34 292c 302c 3136
2127400 3b78 5f75 6e62 7566 5f5f 3973 7472 6561 6d62 7566 3a28 302c 3429 2c31 362c 3136 3b78 5f62 6173 655f 5f39 7374 7265 616d
2127460 6275 663a 2830 2c33 3129 2c33 322c 3332 3b78 5f70 6261 7365 5f5f 3973 7472 6561 6d62 7566 3a28 302c 3331 292c 3634 2c33
2127540 323b 785f 7070 7472 5f5f 3973 7472 6561 6d62 7566 3a28 302c 3331 292c 3936 2c33 323b 785f 6570 7074 725f 5f39 7374 7265
2127620 616d 6275 663a 2830 2c33 3129 2c31 3238 2c33 323b 785f 6770 7472 5f5f 3973 7472 6561 6d62 7566 3a28 302c 3331 292c 3136
2127700 302c 3332 3b78 5f65 6770 7472 5f5f 3973 7472 6561 6d62 7566 3a28 302c 3331 292c 3139 322c 3332 3b5c 0078 5f65 6261 636b
2127760 5f5f 3973 7472 6561 6d62 7566 3a28 302c 3331 292c 3232 342c 3332 3b78 5f62 6c65 6e5f 5f39 7374 7265 616d 6275 663a 2830
2130040 2c31 292c 3235 362c 3332 3b5f 5f76 7074 725f 5f39 7374 7265 616d 6275 663a 2830 2c33 3029 2c32 3838 2c33 323b 6670 5f5f
2130120 3873 7464 696f 6275 663a 2830 2c36 3729 3d2a 2830 2c36 3529 3d78 735f 696f 6275 663a 2c33 3230 2c33 323b 6c61 7374 5f6f
2130200 705f 5f38 7374 6469 6f62 7566 3a28 302c 3129 2c33 3532 2c33 323b 6275 665f 5f38 7374 6469 6f62 7566 3a28 302c 3638 293d
2130260 6172 2830 2c31 293b 303b 313b 2830 2c32 292c 3338 342c 3136 3b3b 0073 7464 696f 6275 663a 5a63 7374 6469 6f62 7566 3b73
2130340 7472 6561 6d62 7566 3b6f 7665 7266 6c6f 775f 5f38 7374 6469 6f62 7566 4669 2075 6e64 6572 666c 6f77 5f5f 3873 7464 696f
2130420 6275 6646 7620 7379 6e63 5f5f 3873 7464 696f 6275 6646 7620 7365 656b 6f66 665f 5f38 7374 6469 6f62 7566 466c 3873 6565
2130500 6b5f 6469 7269 2070 6261 636b 6661 696c 5f5f 3873 7464 696f 6275 6646 6920 5f5f 6374 5f5f 3873 7464 696f 6275 6646 5036
2130560 5f69 6f62 7566 205f 5f63 745f 5f38 7374 6469 6f62 7566 4652 4338 7374 6469 6f62 7566 205c 0073 7464 696f 6669 6c65 5f5f
2130640 3873 7464 696f 6275 6646 7620 5f5f 6474 5f5f 3873 7464 696f 6275 6646 7620 3b3b 3b00 6669 6c65 6275 663a 5428 302c 3639
2130720 293d 7336 3461 6c6c 6f63 5f5f 3973 7472 6561 6d62 7566 3a28 302c 3429 2c30 2c31 363b 735f 756e 6275 665f 5f39 7374 7265
2131000 616d 6275 663a 2830 2c34 292c 3136 2c31 363b 785f 6261 7365 5f5f 3973 7472 6561 6d62 7566 3a28 302c 3331 292c 3332 2c33
2131060 323b 785f 7062 6173 655f 5f39 7374 7265 616d 6275 663a 2830 2c33 3129 2c36 342c 3332 3b78 5f70 7074 725f 5f39 7374 7265
2131140 616d 6275 663a 2830 2c33 3129 2c39 362c 3332 3b78 5f65 7070 7472 5f5f 3973 7472 6561 6d62 7566 3a28 302c 3331 292c 3132
2131220 382c 3332 3b78 5f67 7074 725f 5f39 7374 7265 616d 6275 663a 2830 2c33 3129 2c31 3630 2c33 323b 785f 6567 7074 725f 5f39
2131300 7374 7265 616d 6275 663a 2830 2c33 3129 2c31 3932 2c33 323b 5c00 785f 6562 6163 6b5f 5f39 7374 7265 616d 6275 663a 2830
2131360 2c33 3129 2c32 3234 2c33 323b 785f 626c 656e 5f5f 3973 7472 6561 6d62 7566 3a28 302c 3129 2c32 3536 2c33 323b 5f5f 7670
2131440 7472 5f5f 3973 7472 6561 6d62 7566 3a28 302c 3330 292c 3238 382c 3332 3b78 6664 5f5f 3766 696c 6562 7566 3a28 302c 3129
```

| | | | | | | | | | | | | | | | | | | | | | | | | |
|---|---|---|---|---|---|---|---|---|---|---|---|---|---|---|---|---|---|---|---|---|---|---|---|---|
| 2131520 | 2c33 | 3230 | 2c33 | 323b | 6d6f | 6465 | 5f5f | 3766 | 696c | 6562 | 7566 | 3a28 | 302c | 3129 | 2c33 | 3532 | 2c33 | 323b | 6f70 | 656e | 6564 | 5f5f | 3766 | 696c |
| 2131600 | 6562 | 7566 | 3a28 | 302c | 3229 | 2c33 | 3834 | 2c38 | 3b6c | 6173 | 745f | 7365 | 656b | 5f5f | 3766 | 696c | 6562 | 7566 | 3a28 | 302c | 3129 | 2c34 | 3136 | 2c33 |
| 2131660 | 323b | 696e | 5f73 | 7461 | 7274 | 5f5f | 3766 | 696c | 6562 | 7566 | 3a28 | 302c | 3331 | 292c | 3434 | 382c | 3332 | 3b6c | 6168 | 6561 | 645f | 5f37 | 6669 | 6c65 |
| 2131740 | 6275 | 663a | 2830 | 2c36 | 3829 | 2c34 | 3830 | 2c31 | 163b | 3b00 | 6f70 | 656e | 7072 | 6f74 | 5f5f | 3766 | 696c | 6562 | 7566 | 3a47 | 2830 | 2c31 | 2900 | 6669 |
| 2132020 | 6c65 | 6275 | 663a | 5a63 | 6669 | 6c65 | 6275 | 663b | 7374 | 7265 | 616d | 6275 | 663b | 5f5f | 6374 | 5f5f | 3766 | 696c | 6562 | 7566 | 4676 | 205f | 5f63 | 745f |
| 2132100 | 5f37 | 6669 | 6c65 | 6275 | 6646 | 6920 | 5f5f | 6374 | 5f5f | 3766 | 696c | 6562 | 7566 | 4669 | 5063 | 5431 | 205f | 5f63 | 745f | 5f37 | 6669 | 6c65 | 6275 | 6646 |
| 2132160 | 5243 | 3766 | 696c | 6562 | 7566 | 2069 | 735f | 6f70 | 656e | 5f5f | 3766 | 696c | 6562 | 7566 | 4676 | 2066 | 645f | 5f37 | 6669 | 6c65 | 6275 | 6646 | 7620 | 6f70 |
| 2132240 | 656e | 5f5f | 3766 | 696c | 6562 | 7566 | 4650 | 4363 | 6954 | 3220 | 6174 | 7461 | 6368 | 5f5f | 3766 | 696c | 6562 | 7566 | 4669 | 2063 | 6c6f | 7365 | 5f5f | 3766 |
| 2132320 | 696c | 6562 | 7566 | 4676 | 205c | 005f | 5f64 | 745f | 5f37 | 6669 | 6c65 | 6275 | 6646 | 7620 | 6f76 | 6572 | 666c | 6f77 | 5f5f | 3766 | 696c | 6562 | 7566 | 4669 |
| 2132400 | 2075 | 6e64 | 6572 | 666c | 6f77 | 5f5f | 3766 | 696c | 6562 | 7566 | 4676 | 2073 | 736e | 635f | 5f37 | 6669 | 6c65 | 6275 | 6646 | 7620 | 7365 | 656b | 6f66 | 665f |
| 2132460 | 5f37 | 6669 | 6c65 | 6275 | 6646 | 6c38 | 7365 | 656b | 5f64 | 6972 | 6920 | 7365 | 7462 | 7566 | 5f5f | 3766 | 696c | 6562 | 7566 | 4650 | 6369 | 206c | 6173 | 745f |
| 2132540 | 6f70 | 5f5f | 3766 | 696c | 6562 | 7566 | 4676 | 203b | 6f70 | 656e | 7072 | 6f74 | 5f5f | 3766 | 696c | 6562 | 7566 | 203b | 3b00 | 6673 | 7472 | 6561 | 6d62 | 6173 |
| 2132620 | 653a | 5428 | 302c | 3730 | 293d | 7331 | 3332 | 6275 | 665f | 5f31 | 3166 | 7374 | 7265 | 616d | 6261 | 7365 | 3a28 | 302c | 3639 | 292c | 302c | 3531 | 323b | 5f5f |
| 2132700 | 7670 | 7472 | 5f5f | 3131 | 6673 | 7472 | 6561 | 6d62 | 6173 | 653a | 2830 | 2c33 | 3029 | 2c35 | 3132 | 2c33 | 323b | 5069 | 6f73 | 3a28 | 302c | 3333 | 292c | 3534 |
| 2132760 | 342c | 3332 | 3b4f | 696f | 733a | 2830 | 2c32 | 3329 | 2c35 | 3736 | 2c34 | 3830 | 3b3b | 0066 | 7374 | 7265 | 616d | 6261 | 7365 | 3a5a | 6366 | 7374 | 7265 | 616d |
| 2133040 | 6261 | 7365 | 3b69 | 6f73 | 3b5f | 5f63 | 745f | 5f31 | 3166 | 7374 | 7265 | 616d | 6261 | 7365 | 4676 | 205f | 5f63 | 745f | 5f31 | 3166 | 7374 | 7265 | 616d | 6261 |
| 2133120 | 7365 | 4650 | 4363 | 6954 | 3220 | 5f5f | 6374 | 5f5f | 3131 | 6673 | 7472 | 6561 | 6d62 | 6173 | 6546 | 6920 | 5f5f | 6374 | 5f5f | 3131 | 6673 | 7472 | 6561 | 6d62 |
| 2133200 | 6173 | 6546 | 6950 | 6354 | 3120 | 5f5f | 6374 | 5f5f | 3131 | 6673 | 7472 | 6561 | 6d62 | 6173 | 6546 | 5231 | 3166 | 7374 | 7265 | 616d | 6261 | 7365 | 205f | 5f64 |
| 2133260 | 745f | 5f31 | 3166 | 7374 | 7265 | 616d | 6261 | 7365 | 4676 | 206f | 7065 | 6e5f | 5f31 | 3166 | 7374 | 7265 | 616d | 6261 | 7365 | 4650 | 4363 | 6954 | 3220 | 5c00 |
| 2133340 | 6174 | 7461 | 6368 | 5f5f | 3131 | 6673 | 7472 | 6561 | 6d62 | 6173 | 6546 | 6920 | 636c | 6f73 | 655f | 5f31 | 3166 | 7374 | 7265 | 616d | 6261 | 7365 | 4676 | 2073 |
| 2133420 | 6574 | 6275 | 665f | 5f31 | 3166 | 7374 | 7265 | 616d | 6261 | 7365 | 4650 | 6369 | 2072 | 6462 | 7566 | 5f5f | 3131 | 6673 | 7472 | 6561 | 6d62 | 6173 | 6546 | 7620 |
| 2133500 | 7665 | 7269 | 6679 | 5f5f | 3131 | 6673 | 7472 | 6561 | 6d62 | 6173 | 6546 | 6920 | 3b3b | 3b00 | 7374 | 6174 | 655f | 7661 | 6c75 | 653a | 7428 | 302c | 3138 | 2900 |
| 2133560 | 5661 | 6c75 | 655f | 5479 | 7065 | 3a54 | 2830 | 2c37 | 3129 | 3d65 | 554e | 4b4e | 4f57 | 4e56 | 3a30 | 2c53 | 5452 | 494e | 473a | 312c | 494e | 5445 | 4745 | 523a |
| 2133640 | 322c | 464c | 4f41 | 543a | 332c | 3b00 | 426c | 6f63 | 6b5f | 5479 | 7065 | 3a54 | 2830 | 2c37 | 3229 | 3d65 | 554e | 4b4e | 4f57 | 4e42 | 3a30 | 2c45 | 4e54 | 4954 |
| 2133720 | 593a | 312c | 4655 | 4e43 | 5449 | 4f4e | 3a32 | 2c50 | 524f | 4345 | 4455 | 5245 | 3a33 | 2c3b | 0045 | 6e74 | 6974 | 795f | 5479 | 7065 | 3a54 | 2830 | 2c37 | 3329 |
| 2134000 | 3d65 | 554e | 4b4e | 4f57 | 4e45 | 3a30 | 2c41 | 5243 | 4849 | 5445 | 4354 | 5552 | 453a | 312c | 5355 | 4250 | 524f | 4752 | 414d | 3a32 | 2c3b | 0050 | 696e | 5f54 |
| 2134060 | 7970 | 653a | 5428 | 302c | 3734 | 293d | 6555 | 4e4b | 4e4f | 574e | 503a | 302c | 494e | 5049 | 4e3a | 312c | 4f55 | 5450 | 494e | 3a32 | 2c49 | 4e4f | 5554 | 5049 |
| 2134140 | 4e3a | 332c | 3b00 | 5061 | 7261 | 5f43 | 6c61 | 7373 | 3a54 | 2830 | 2c37 | 3529 | 3465 | 554e | 4b4e | 4f57 | 4e43 | 3a30 | 2c46 | 4f52 | 4d41 | 4c3a | 312c | 4143 |
| 2134220 | 5455 | 414c | 3a32 | 2c52 | 4553 | 4f4c | 5645 | 443a | 332c | 3b00 | 424f | 4f4c | 4541 | 4e3a | 5428 | 302c | 3736 | 293d | 6546 | 616c | 7365 | 3a30 | 2c54 | 7275 |
| 2134300 | 653a | 312c | 3b00 | 426f | 6f6c | 6561 | 6e3a | 5428 | 302c | 3737 | 293d | 6566 | 616c | 7365 | 3a30 | 2c74 | 7275 | 653a | 312c | 3b00 | 4275 | 6666 | 6572 | 3a47 |
| 2134360 | 2830 | 2c33 | 3129 | 0049 | 4f5f | 4d61 | 6e61 | 6765 | 723a | 5428 | 302c | 3738 | 293d | 7333 | 3669 | 6670 | 5f5f | 3130 | 494f | 5f4d | 616e | 6167 | 6572 | 3a28 |
| 2134440 | 302c | 3637 | 292c | 302c | 3332 | 3b6f | 6670 | 5f5f | 3130 | 494f | 5f4d | 616e | 6167 | 6572 | 3a28 | 302c | 3637 | 292c | 3332 | 2c33 | 323b | 6d66 | 705f | 5f31 |
| 2134520 | 3049 | 4f5f | 4d61 | 6e61 | 6765 | 723a | 2830 | 2c36 | 3729 | 2c36 | 342c | 3332 | 3b63 | 6670 | 5f5f | 3130 | 494f | 5f4d | 616e | 6167 | 6572 | 3a28 | 302c | 3637 |
| 2134600 | 292c | 3936 | 2c33 | 323b | 4946 | 696c | 654e | 616d | 655f | 5f31 | 3049 | 4f5f | 4d61 | 6e61 | 6765 | 723a | 2830 | 2c33 | 3129 | 2c31 | 3238 | 2c33 | 323b | 4f46 |
| 2134660 | 696c | 654e | 616d | 655f | 5f31 | 3049 | 4f5f | 4d61 | 6e61 | 6765 | 723a | 2830 | 2c33 | 3129 | 2c31 | 3630 | 2c33 | 323b | 4d46 | 696c | 654e | 616d | 655f | 5f31 |
| 2134740 | 3049 | 4f5f | 4d61 | 6e61 | 6765 | 723a | 2830 | 2c33 | 3129 | 2c31 | 3932 | 2c33 | 323b | 4346 | 696c | 654e | 616d | 655f | 5f31 | 3049 | 4f5f | 4d61 | 6e61 | 6765 |
| 2135020 | 723a | 2830 | 2c33 | 3129 | 2c32 | 3234 | 2c33 | 323b | 6375 | 4c69 | 6e65 | 5f5f | 3130 | 494f | 5f4d | 616e | 6167 | 6572 | 3a28 | 302c | 3129 | 2c32 | 3536 | 2c33 |
| 2135100 | 323b | 3b00 | 494f | 5f4d | 616e | 6167 | 6572 | 3a5a | 6349 | 4f5f | 4d61 | 6e61 | 6765 | 723b | 3b5f | 5f63 | 745f | 5f31 | 3049 | 4f5f | 4d61 | 6e61 | 6765 | 7246 |
| 2135160 | 5063 | 205f | 5f64 | 745f | 5f31 | 3049 | 4f5f | 4d61 | 6e61 | 6765 | 7246 | 7620 | 494f | 4368 | 6563 | 6b5f | 5f31 | 3049 | 4f5f | 4d61 | 6e61 | 6765 | 7246 | 7620 |
| 2135240 | 436f | 7079 | 4669 | 6c65 | 546f | 4c69 | 6e65 | 5f5f | 3130 | 494f | 5f4d | 616e | 6167 | 6572 | 4669 | 2043 | 6f70 | 7946 | 696c | 6554 | 6f45 | 6e64 | 5f5f | 3130 |
| 2135320 | 494f | 5f4d | 616e | 6167 | 6572 | 4676 | 2053 | 7461 | 746d | 656e | 7448 | 616e | 6465 | 6c65 | 725f | 5f31 | 3049 | 4f5f | 4d61 | 6e61 | 6765 | 7246 | 5063 | 5431 |
| 2135400 | 6920 | 5c00 | 436f | 7079 | 4669 | 6c65 | 546f | 4b65 | 7957 | 5f5f | 3130 | 494f | 5f4d | 616e | 6167 | 6572 | 4650 | 6354 | 3120 | 4561 | 745f | 5374 | 6174 | 656d |
| 2135460 | 656e | 745f | 5f31 | 3049 | 4f5f | 4d61 | 6e61 | 6765 | 7246 | 5063 | 5431 | 2057 | 5f4f | 7574 | 4669 | 6c65 | 5f5f | 3130 | 494f | 5f4d | 616e | 6167 | 6572 | 4650 |
| 2135540 | 6320 | 575f | 4d46 | 696c | 655f | 5f31 | 3049 | 4f5f | 4d61 | 6e61 | 6765 | 7246 | 5063 | 2057 | 5f43 | 4669 | 6c65 | 5f5f | 3130 | 494f | 5f4d | 616e | 6167 | 6572 |
| 2135620 | 4650 | 6320 | 3b3b | 3b00 | 494f | 5f42 | 7566 | 6665 | 723a | 4728 | 302c | 3739 | 293d | 6172 | 2830 | 2c31 | 293b | 303b | 3531 | 313b | 2830 | 2c32 | 2900 | 494f |
| 2135700 | 5f41 | 7578 | 6c72 | 7941 | 3a47 | 2830 | 2c37 | 3929 | 0049 | 4f5f | 4175 | 786c | 7279 | 423a | 4728 | 302c | 3739 | 2900 | 494f | 4175 | 783a | 4728 | 302c | 3331 |
| 2135760 | 2900 | 494f | 4d61 | 6e2e | 6378 | 7800 | 494f | 4175 | 7842 | 3a47 | 2830 | 2c33 | 3129 | 0049 | 4f42 | 7566 | 663a | 4728 | 302c | 3331 | 2900 | 5f5f | 6374 | 5f5f |
| 2136040 | 3130 | 494f | 5f4d | 616e | 6167 | 6572 | 4650 | 633a | 4628 | 302c | 3830 | 293d | 2a28 | 302c | 3738 | 2900 | 5f5f | 3074 | 6869 | 733a | 7028 | 302c | 3830 | 2900 |
| 2136120 | 5f5f | 3049 | 4e61 | 6d65 | 3a70 | 2830 | 2c33 | 3129 | 005f | 5f30 | 7468 | 6973 | 3a72 | 2830 | 2c38 | 3029 | 005f | 5f31 | 6374 | 656d | 703a | 2830 | 2c33 | 3129 |
| 2136200 | 005f | 5f30 | 7468 | 6973 | 203a | 5a74 | 6c00 | 5f5f | 3049 | 4e61 | 6d65 | 203a | 5a74 | 6c00 | 5f5f | 3163 | 7465 | 6d70 | 203a | 5a74 | 6c00 | 5f5f | 6374 | 5f5f |
| 2136260 | 3130 | 494f | 5f4d | 616e | 6167 | 6572 | 4650 | 6320 | 3a5a | 7446 | 0049 | 4f43 | 6865 | 636b | 5f5f | 3130 | 494f | 5f4d | 616e | 6167 | 6572 | 4676 | 3a46 | 2830 |
| 2136340 | 2c31 | 2900 | 5f5f | 3074 | 6869 | 733a | 7028 | 302c | 3830 | 2900 | 5f5f | 3074 | 6869 | 733a | 7228 | 302c | 3830 | 2900 | 5f5f | 3074 | 6869 | 7320 | 3a5a | 746c |
| 2136420 | 0049 | 4f43 | 6865 | 636b | 5f5f | 3130 | 494f | 5f4d | 616e | 6167 | 6572 | 4676 | 203a | 5a74 | 4600 | 436f | 7079 | 4669 | 6c65 | 546f | 456e | 645f | 5f31 | 3049 |
| 2136500 | 4f5f | 4d61 | 6e61 | 6765 | 7246 | 763a | 4628 | 302c | 3229 | 005f | 5f30 | 7468 | 6973 | 3a70 | 2830 | 2c38 | 3029 | 005f | 5f30 | 7468 | 6973 | 3a72 | 2830 | 2c38 |
| 2136560 | 3029 | 005f | 5f30 | 5f5f | 5873 | 3030 | 6168 | 6878 | 6e68 | 3a28 | 302c | 3331 | 2900 | 5f5f | 3074 | 6869 | 7320 | 3a5a | 746c | 005f | 5f30 | 5f5f | 5873 | 3030 |

| | | | | | | | | | | | | | | | | | | | | | | | | |
|---|---|---|---|---|---|---|---|---|---|---|---|---|---|---|---|---|---|---|---|---|---|---|---|---|
| 2136640 | 6168 | 6878 | 6e68 | 203a | 5a74 | 6c00 | 436f | 7079 | 4669 | 6c65 | 546f | 456e | 645f | 5f31 | 3049 | 4f5f | 4d61 | 6e61 | 6765 | 7246 | 7620 | 3a5a | 7446 | 0043 |
| 2136720 | 6f70 | 7946 | 696c | 6554 | 6f4c | 696e | 655f | 5f31 | 3049 | 4f5f | 4d61 | 6e61 | 6765 | 7246 | 693a | 4628 | 302c | 3129 | 005f | 5f30 | 7468 | 6973 | 3a70 | 2830 |
| 2137000 | 2c38 | 3029 | 005f | 5f30 | 4c69 | 6e65 | 3a70 | 2830 | 2c31 | 2900 | 5f5f | 3074 | 6869 | 733a | 7228 | 302c | 3830 | 2900 | 5f5f | 3169 | 3a28 | 302c | 3129 | 005f |
| 2137060 | 5f30 | 5f5f | 5873 | 3030 | 6168 | 6878 | 6e68 | 3a28 | 302c | 3331 | 2900 | 5f5f | 3074 | 6869 | 7320 | 3a5a | 746c | 005f | 5f30 | 4c69 | 6e65 | 203a | 5a74 | 6c00 |
| 2137140 | 5f5f | 3169 | 203a | 5a74 | 6c00 | 5f5f | 305f | 5f58 | 7330 | 3061 | 6868 | 786e | 6920 | 3a5a | 746c | 0043 | 6f70 | 7946 | 696c | 6554 | 6f4c | 696e | 655f | 5f31 |
| 2137220 | 3049 | 4f5f | 4d61 | 6e61 | 6765 | 7246 | 6920 | 3a5a | 7446 | 0043 | 6f70 | 7946 | 696c | 6554 | 6f4b | 6579 | 575f | 5f31 | 3049 | 4f5f | 4d61 | 6e61 | 6765 | 7246 |
| 2137300 | 5063 | 5431 | 3a46 | 2830 | 2c31 | 2900 | 5f5f | 3074 | 6869 | 733a | 7028 | 302c | 3830 | 2900 | 5f5f | 3073 | 3a70 | 2830 | 2c33 | 3129 | 005f | 5f30 | 6c65 | 6674 |
| 2137360 | 4f76 | 6572 | 3a70 | 2830 | 2c33 | 3129 | 005f | 5f30 | 7468 | 6973 | 203a | 5a74 | 6c00 | 5f5f | 3073 | 203a | 5a74 | 6c00 | 5f5f | 306c | 6566 | 744f | 7665 | 7220 |
| 2137440 | 3a5a | 746c | 0043 | 6f70 | 7946 | 696c | 6554 | 6f4b | 6579 | 575f | 5f31 | 3049 | 4f5f | 4d61 | 6e61 | 6765 | 7246 | 5063 | 5431 | 203a | 5a74 | 4600 | 4561 | 745f |
| 2137520 | 5374 | 6174 | 6563 | 656e | 745f | 5f31 | 3049 | 4f5f | 4d61 | 6e61 | 6765 | 7246 | 5363 | 5431 | 3a46 | 2830 | 2c31 | 2900 | 5f5f | 3074 | 6869 | 733a | 7028 | 302c |
| 2137600 | 3830 | 2900 | 5f5f | 3073 | 3a70 | 2830 | 2c33 | 3129 | 005f | 5f30 | 6c65 | 6674 | 4f76 | 6572 | 3a70 | 2830 | 2c33 | 3129 | 005f | 5f30 | 7468 | 6973 | 203a | 5a74 |
| 2137660 | 6c00 | 5f5f | 3073 | 203a | 5a74 | 6c00 | 5f5f | 306c | 6566 | 744f | 7665 | 7220 | 3a5a | 746c | 0045 | 6174 | 5f53 | 7461 | 7465 | 6d65 | 6e74 | 5f5f | 3130 | 494f |
| 2137740 | 5f4d | 616e | 6167 | 6572 | 4650 | 6354 | 3120 | 3a5a | 7446 | 0053 | 7461 | 746d | 656e | 7448 | 616e | 6465 | 6c65 | 725f | 5f31 | 3049 | 4f5f | 4d61 | 6e61 | 6765 |
| 2140020 | 7246 | 5063 | 5431 | 693a | 4628 | 302c | 3129 | 005f | 5f30 | 7468 | 6973 | 3a70 | 2830 | 2c38 | 3029 | 005f | 5f30 | 4b65 | 7957 | 3a70 | 2830 | 2c33 | 3129 | 005f |
| 2140100 | 5f30 | 6c65 | 6674 | 4f76 | 6572 | 3a70 | 2930 | 2c33 | 3129 | 005f | 5f30 | 436f | 7079 | 466c | 6167 | 3a70 | 2830 | 2c31 | 2900 | 5f5f | 3074 | 6869 | 733a | 7228 |
| 2140160 | 302c | 3830 | 2900 | 5f5f | 3169 | 3a28 | 302c | 3129 | 005f | 5f31 | 6370 | 3a28 | 302c | 3331 | 2900 | 5f5f | 3146 | 6972 | 7374 | 5365 | 673a | 2830 | 2c33 | 3129 |
| 2140240 | 005f | 5f31 | 5365 | 636f | 6e64 | 5365 | 673a | 2830 | 2c33 | 3129 | 005f | 5f30 | 5f5f | 5873 | 3030 | 6168 | 6878 | 6e68 | 3a28 | 302c | 3331 | 2900 | 5f5f | 3074 |
| 2140320 | 6869 | 7320 | 3a5a | 746c | 005f | 5f30 | 4b65 | 7957 | 203a | 5a74 | 6c00 | 5f5f | 306c | 6566 | 744f | 7665 | 7220 | 3a5a | 746c | 005f | 5f30 | 436f | 7079 | 466c |
| 2140400 | 6167 | 203a | 5a74 | 6c00 | 5f5f | 3169 | 203a | 5a74 | 6c00 | 5f5f | 3163 | 7020 | 3a5a | 746c | 005f | 5f31 | 4669 | 7273 | 7453 | 6567 | 203a | 5a74 | 6c00 | 5f5f |
| 2140460 | 3153 | 6563 | 6f6e | 6453 | 6567 | 203a | 5a74 | 6c00 | 5f5f | 305f | 5f58 | 7330 | 3061 | 6868 | 786e | 6820 | 3a5a | 746c | 0053 | 7461 | 746d | 656e | 7448 | 616e |
| 2140540 | 6465 | 6c65 | 725f | 5f31 | 3049 | 4f5f | 4361 | 6e61 | 6765 | 7246 | 5063 | 5431 | 6920 | 3a5a | 7446 | 005f | 5f73 | 7469 | 5f5f | 494f | 4d61 | 6e5f | 6378 | 785f |
| 2140620 | 494f | 4175 | 785f | 3a46 | 2830 | 2c32 | 2900 | 2f75 | 7372 | 2f43 | 432f | 7375 | 6e34 | 2f69 | 6e63 | 6c2f | 696f | 7374 | 7265 | 616d | 2e68 | 005f | 5f73 | 7464 |
| 2140700 | 5f5f | 494f | 4d61 | 6e5f | 6378 | 785f | 494f | 4175 | 785f | 3a46 | 2830 | 2c32 | 2900 | 4765 | 6e56 | 616c | 7565 | 2e6f | 005f | 7365 | 7450 | 726f | 705f | 5f37 |
| 2140760 | 4e4f | 626a | 6563 | 7446 | 5063 | 6600 | 5f73 | 6574 | 5072 | 6f70 | 5f5f | 374e | 4f62 | 6a65 | 6374 | 4650 | 6369 | 005f | 6765 | 7441 | 7474 | 725f | 5f37 | 4e4f |
| 2141040 | 626a | 6563 | 7446 | 6900 | 5f70 | 7574 | 5f5f | 376f | 7374 | 7265 | 616d | 4663 | 005f | 7365 | 7450 | 726f | 705f | 5f37 | 4e4f | 626a | 6563 | 7446 | 5063 | 5431 |
| 2141120 | 005f | 696f | 7374 | 7265 | 616d | 5f69 | 6e69 | 7400 | 5f69 | 734c | 5445 | 5f5f | 374e | 4f62 | 6a65 | 6374 | 4650 | 364f | 626a | 6563 | 7400 | 5f69 | 7347 | 5445 |
| 2141200 | 5f5f | 374e | 4f62 | 6a65 | 6374 | 4650 | 364f | 626a | 6563 | 7400 | 5f65 | 7870 | 6c61 | 696e | 5f5f | 384c | 504f | 626a | 6563 | 7446 | 5063 | 005f | 6765 | 7450 |
| 2141260 | 726f | 705f | 5f37 | 4e4f | 626a | 6563 | 7446 | 5063 | 6900 | 5f69 | 6e4f | 7264 | 6572 | 5f5f | 364f | 626a | 6563 | 7446 | 5036 | 4f62 | 6a65 | 6374 | 002f | 686f |
| 2141340 | 6d65 | 2f6f | 7361 | 7331 | 2f61 | 2f61 | 622f | 7372 | 632f | 6e65 | 776f | 626a | 6563 | 7473 | 2f70 | 726f | 672f | 432b | 2b2e | 3139 | 3038 | 352f | 0047 | 656e |
| 2141420 | 5661 | 6c75 | 652e | 6300 | 4765 | 6e56 | 616c | 7565 | 2e63 | 7878 | 0069 | 6e74 | 3a74 | 2830 | 2c31 | 293d | 7228 | 302c | 3129 | 3b2d | 3231 | 3437 | 3438 | 3336 |
| 2141500 | 3438 | 3b32 | 3134 | 3734 | 3833 | 3634 | 373b | 0063 | 6861 | 723a | 7428 | 302c | 3229 | 3d72 | 2830 | 2c32 | 293b | 303b | 3132 | 373b | 006c | 6f6e | 673a | 7428 |
| 2141560 | 302c | 3329 | 3d72 | 2830 | 2c31 | 293b | 2d32 | 3134 | 3734 | 3833 | 3634 | 383b | 3231 | 3437 | 3438 | 3336 | 3437 | 3b00 | 7368 | 6f72 | 743a | 7428 | 302c | 3429 |
| 2141640 | 3d72 | 2830 | 2c31 | 293b | 2d33 | 3237 | 3638 | 3b33 | 3237 | 3637 | 3b00 | 756e | 7369 | 676e | 6564 | 2063 | 6861 | 723a | 7428 | 302c | 3529 | 3d72 | 2830 | 2c31 |
| 2141720 | 293b | 303b | 3235 | 353b | 0075 | 6e73 | 6967 | 6e65 | 6420 | 7368 | 6f72 | 743a | 7428 | 302c | 3629 | 3d72 | 2830 | 2c31 | 293b | 303b | 3635 | 3533 | 353b | 0075 |
| 2142000 | 6e73 | 6967 | 6e65 | 6420 | 6c6f | 6e67 | 3a74 | 2830 | 2c37 | 293d | 7228 | 302c | 3129 | 3b30 | 3b2d | 313b | 0075 | 6e73 | 6967 | 6e65 | 6420 | 696e | 743a | 7428 |
| 2142060 | 302c | 3829 | 3d72 | 2830 | 2c31 | 293b | 303b | 2d31 | 3b00 | 666c | 6f61 | 743a | 7428 | 302c | 3929 | 3d72 | 2830 | 2c31 | 293b | 343b | 303b | 0064 | 6f75 | 626c |
| 2142140 | 653a | 7428 | 302c | 3130 | 293d | 7229 | 302c | 3129 | 3b38 | 3b30 | 3b00 | 766f | 6964 | 3a74 | 2830 | 2c31 | 3129 | 3d28 | 302c | 3131 | 2900 | 3f3f | 3f3a | 7428 |
| 2142220 | 302c | 3132 | 293d | 2830 | 2c31 | 2900 | 5f5f | 7670 | 7470 | 3a74 | 2830 | 2c31 | 3329 | 3d2a | 2830 | 2c31 | 3429 | 3d66 | 2830 | 2c31 | 2900 | 5f5f | 6d70 | 7472 |
| 2142300 | 3a54 | 2830 | 2c31 | 3529 | 3d73 | 3864 | 3a28 | 302c | 3429 | 2c30 | 2c31 | 363b | 693a | 2830 | 2c34 | 292c | 3136 | 2c31 | 363b | 663a | 2830 | 2c31 | 3329 | 2c33 |
| 2142360 | 322c | 3332 | 3b3b | 005f | 5046 | 565f | 3a74 | 2830 | 2c31 | 3629 | 3d2a | 2830 | 2c31 | 3729 | 3d66 | 2830 | 2c32 | 2900 | 5f50 | 4649 | 5f3a | 7428 | 302c | 3133 |
| 2142440 | 2900 | 7374 | 7265 | 616d | 706f | 733a | 7428 | 302c | 3129 | 0073 | 7472 | 6561 | 6d6f | 6666 | 3a74 | 2830 | 2c31 | 2900 | 696f | 5f73 | 7461 | 7465 | 3a54 | 2830 |
| 2142520 | 2c31 | 3829 | 3d65 | 676f | 6f64 | 6269 | 745f | 5f69 | 6f5f | 7374 | 6174 | 653a | 302c | 656f | 6662 | 6974 | 5f5f | 696f | 5f73 | 7461 | 7465 | 3a31 | 2c66 | 6169 |
| 2142600 | 6c62 | 6974 | 5f5f | 696f | 5f73 | 7461 | 7465 | 3a32 | 2c62 | 6164 | 6269 | 745f | 5f69 | 6f5f | 7374 | 6174 | 653a | 332c | 6861 | 7264 | 6661 | 696c | 5f5f | 696f |
| 2142660 | 5f73 | 7461 | 7465 | 3a34 | 2c3b | 006f | 7065 | 6e5f | 6d6f | 6465 | 3a54 | 2830 | 2c31 | 3929 | 3d65 | 696e | 5f5f | 6f70 | 656e | 5f6d | 6f64 | 653a | 302c | 6f75 |
| 2142740 | 745f | 5f6f | 7065 | 6e5f | 6d6f | 6465 | 3a31 | 2c61 | 7465 | 5f5f | 6f70 | 656e | 5f6d | 6f64 | 653a | 322c | 6170 | 705f | 5f6f | 7065 | 6e5f | 6d6f | 6465 | 3a33 |
| 2143020 | 2c74 | 7275 | 6e63 | 5f5f | 6f70 | 656e | 5f6d | 6f64 | 653a | 342c | 6e6f | 6372 | 6561 | 7465 | 5f5f | 6f70 | 656e | 5f6d | 6f64 | 653a | 352c | 6e6f | 7265 | 706c |
| 2143100 | 6163 | 655f | 5f6f | 7065 | 6e5f | 6d6f | 6465 | 3a36 | 2c3b | 0073 | 6565 | 6b5f | 6469 | 723a | 5428 | 302c | 3230 | 293d | 6562 | 6567 | 5f5f | 7365 | 656b | 5f64 |
| 2143160 | 6972 | 3a30 | 2c63 | 7572 | 5f5f | 7365 | 656b | 5f64 | 6972 | 3a31 | 2c65 | 6e64 | 5f5f | 7365 | 656b | 5f64 | 6972 | 3a32 | 2c3b | 005f | 5f45 | 313a | 5428 | 302c |
| 2143240 | 3231 | 293d | 6573 | 6b69 | 7077 | 735f | 5f5f | 5f45 | 313a | 302c | 6c65 | 6674 | 5f5f | 5f5f | 4531 | 3a31 | 2c72 | 6967 | 6874 | 5f5f | 5f5f | 4531 | 3a32 | 2c69 |
| 2143320 | 6e74 | 6572 | 6e61 | 6c5f | 5f5f | 5f45 | 313a | 332c | 6465 | 635f | 5f5f | 5f45 | 313a | 342c | 6f63 | 745f | 5f5f | 5f45 | 313a | 352c | 6865 | 785f | 5f5f | 5f45 |
| 2143400 | 313a | 362c | 7368 | 6f77 | 6261 | 7365 | 5f5f | 5f5f | 4531 | 3a37 | 2c5c | 0073 | 686f | 7770 | 6f69 | 6e74 | 5f5f | 5f5f | 4531 | 3a38 | 2c75 | 7070 | 6572 | 6361 |
| 2143460 | 7365 | 5f5f | 5f5f | 4531 | 3a39 | 2c73 | 6d6f | 7770 | 6f73 | 5f5f | 5f5f | 4531 | 3a31 | 302c | 7363 | 6965 | 6e74 | 6966 | 6963 | 5f5f | 5f5f | 4531 | 3a31 | 312c |
| 2143540 | 6669 | 7865 | 645f | 5f5f | 5f45 | 313a | 3132 | 2c75 | 6e69 | 7462 | 7566 | 5f5f | 5f5f | 4531 | 3a31 | 332c | 7374 | 6469 | 6f5f | 5f5f | 5f45 | 313a | 3134 | 2c3b |
| 2143620 | 005f | 5f45 | 323a | 5428 | 302c | 3232 | 293d | 6573 | 6b69 | 7070 | 696e | 675f | 5f5f | 5f45 | 323a | 302c | 7469 | 6564 | 5f5f | 5f5f | 4532 | 3a31 | 2c3b | 0069 |
| 2143700 | 6f73 | 3a54 | 2830 | 2c32 | 3329 | 3d73 | 3630 | 6e75 | 7365 | 725f | 5f33 | 696f | 733a | 2830 | 2c31 | 292c | 302c | 3332 | 3b78 | 5f75 | 7365 | 725f | 5f33 | 696f |

```
2143760 733a 2830 2c32 3729 3d2a 2830 2c32 3429 3d78 7569 6f73 5f75 7365 725f 756e 696f 6e3a 2c33 322c 3332 3b62 705f 5f33 696f
2144040 733a 2830 2c32 3829 3d2a 2830 2c32 3529 3d78 7373 7472 6561 6d62 7566 3a2c 3634 2c33 323b 7374 6174 655f 5f33 696f 733a
2144120 2830 2c31 292c 3936 2c33 323b 6973 7065 6369 616c 5f5f 3369 6f73 3a28 302c 3129 2c31 3238 2c33 323b 6f73 7065 6369 616c
2144200 5f5f 3369 6f73 3a28 302c 3129 2c31 3630 2c33 323b 6973 6678 5f73 7065 6369 616c 5f5f 3369 6f73 3a28 302c 3129 2c31 3932
2144260 2c33 323b 6f73 6678 5f73 7065 6369 616c 5f5f 3369 6f73 3a28 302c 3129 2c32 3234 2c33 323b 5c00 6465 6c62 7566 5f5f 3369
2144340 6f73 3a28 302c 3129 2c32 3536 2c33 323b 785f 7469 655f 5f33 696f 733a 2830 2c32 3929 3d2a 2830 2c32 3629 3d78 736f 7374
2144420 7265 616d 3a2c 3238 382c 3332 3b78 5f66 6c61 6773 5f5f 3369 6f73 3a28 302c 3129 2c33 3230 2c33 323b 785f 7072 6563 6973
2144500 696f 6e5f 5f33 696f 733a 2830 2c34 292c 3335 322c 3136 3b78 5f66 696c 6c5f 5f33 696f 733a 2830 2c32 292c 3336 382c 383b
2144560 785f 7769 6474 685f 5f33 696f 733a 2830 2c34 292c 3338 342c 3136 3b61 7373 6967 6e5f 7072 6976 6174 655f 5f33 696f 733a
2144640 2830 2c31 292c 3431 362c 3332 3b5f 5f76 7074 725f 5f33 696f 733a 2830 2c33 3029 3d2a 2830 2c31 3529 2c34 3438 2c33 323b
2144720 3b00 6261 7365 6669 656c 645f 5f33 696f 733a 4728 302c 3129 0061 646a 7573 7466 6965 6c64 5f5f 3369 6f73 3a47 2830 2c31
2145000 2900 666c 6f61 7466 6965 6c64 5f5f 3369 6f73 3a47 2830 2c31 2900 6e65 7874 6269 745f 5f33 696f 733a 4728 302c 3129 006e
2145060 6578 7477 6f72 645f 5f33 696f 733a 4728 302c 3129 0073 7464 696f 666c 7573 685f 5f33 696f 733a 4728 302c 3136 2900 696f
2145140 733a 5a63 696f 733b 3b5f 5f63 745f 5f33 696f 7346 5039 7374 7265 616d 6275 6620 5f5f 6374 5f5f 3369 6f73 4676 205f 5f63
2145220 745f 5f33 696f 7346 5233 696f 7320 5f5f 6474 5f5f 3369 6f73 4676 2066 6c61 6773 5f5f 3369 6f73 4676 2066 6c61 6773 5f5f
2145300 3369 6f73 466c 2073 6574 665f 5f33 696f 7346 6c54 3120 7365 7466 5f5f 3369 6f73 466c 2075 6e73 6574 665f 5f33 696f 7346
2145360 6c20 7769 6474 685f 5f33 696f 7346 7620 7769 6474 685f 5f33 696f 7346 6920 7469 655f 5f33 696f 7346 5037 6f73 7472 6561
2145440 6d20 5c00 7469 655f 5f33 696f 7346 7620 6669 6c6c 5f5f 3369 6f73 4663 2066 696c 6c5f 5f33 696f 7346 7620 7072 6563 6973
2145520 696f 6e5f 5f33 696f 7346 6920 7072 6563 6973 696f 6e5f 5f33 696f 7346 7620 7264 7374 6174 655f 5f33 696f 7346 7620 5f5f
2145600 6f70 5076 5f5f 3369 6f73 4676 205f 5f6e 745f 5f33 696f 7346 7620 656f 665f 5f33 696f 7346 7620 6661 696c 5f5f 3369 6f73
2145660 4676 2062 6164 5f5f 3369 6f73 4676 2067 6f6f 645f 5f33 696f 7346 7620 636c 6561 725f 5f33 696f 7346 6920 7264 6275 665f
2145740 5f33 696f 7346 7620 5c00 6977 6f72 645f 5f33 696f 7346 6920 7077 6f72 645f 5f33 696f 7346 6920 6269 7461 6c6c 6f63 5f5f
2146020 3369 6f73 5346 7620 7861 6c6c 6f63 5f5f 3369 6f73 5346 7620 7572 6573 697a 655f 5f33 696f 7346 6920 7379 6e63 5f77 6974
2146100 685f 7374 6469 6f5f 5f33 696f 7353 4676 2073 6574 7374 6174 655f 5f33 696f 7346 6920 696e 6974 5f5f 3369 6f73 4650 3973
2146160 7472 6561 6d62 7566 205f 5f61 735f 5f33 696f 7346 5233 696f 7320 736b 6970 5f5f 3369 6f73 4669 203b 6261 7365 6669 656c
2146240 645f 5f33 696f 7320 5c00 6164 6a75 7374 6669 656c 645f 5f33 696f 7320 666c 6f61 7466 6965 6c64 5f5f 3369 6f73 206e 6578
2146320 7462 6974 5f5f 3369 6f73 206e 6578 7477 6f72 645f 5f33 696f 7320 7374 6469 6f66 6c75 7368 5f5f 3369 6f73 203b 3b00 7374
2146400 7265 616d 6275 663a 5428 302c 3235 293d 7334 3061 6c6c 6f63 5f5f 3973 7472 6561 6d62 7566 3a28 302c 3429 2c30 2c31 363b
2146460 785f 756e 6275 665f 5f39 7374 7265 616d 6275 663a 2830 2c34 292c 3136 2c31 363b 785f 6261 7365 5f5f 3973 7472 6561 6d62
2146540 7566 3a28 302c 3331 293d 2a28 302c 3229 2c33 322c 3332 3b78 5f70 6261 7365 5f5f 3973 7472 6561 6d62 7566 3a28 302c 3331
2146620 292c 3634 2c33 323b 785f 7070 7472 5f5f 3973 7472 6561 6d62 7566 3a28 302c 3331 292c 3936 2c33 323b 785f 6570 7074 725f
2146700 5f39 7374 7265 616d 6275 663a 2830 2c33 3129 2c31 3238 2c33 323b 785f 6770 7472 5f5f 3973 7472 6561 6d62 7566 3a28 302c
2146760 3331 292c 3136 302c 3332 3b78 5f65 6770 7472 5f5f 3973 7472 6561 6d62 7566 3a28 302c 3331 292c 3139 322c 3332 3b5c 0078
2147040 5f65 6261 636b 5f5f 3973 7472 6561 6d62 7566 3a28 302c 3331 292c 3232 342c 3332 3b78 5f62 6c65 6e5f 5f39 7374 7265 616d
2147120 6275 663a 2830 2c31 292c 3235 362c 3332 3b5f 5f76 7074 725f 5f39 7374 7265 616d 6275 663a 2830 2c33 3029 2c32 3838 2c33
2147200 323b 3b00 7374 7265 616d 6275 663a 5a63 7374 7265 616d 6275 663b 3b5f 5f63 745f 5f39 7374 7265 616d 6275 6646 5239 7374
2147260 7265 616d 6275 6620 5f5f 6374 5f5f 3973 7472 6561 6d62 7566 4676 205f 5f63 745f 5f39 7374 7265 616d 6275 6646 5063 6920
2147340 5f5f 6374 5f5f 3973 7472 6561 6d62 7566 4650 6369 5432 205f 5f61 735f 5f39 7374 7265 616d 6275 6646 5239 7374 7265 616d
2147420 6275 6620 6462 705f 5f39 7374 7265 616d 5275 6646 7620 6261 7365 5f5f 3973 7472 6561 6d62 7566 4676 2070 6261 7365 5f5f
2147500 3973 7472 6561 6d62 7566 4676 205c 0070 7374 725f 5f39 7374 7265 616d 6275 6646 7620 6570 7074 725f 5f39 7374 7265 616d
2147560 6275 6646 7620 6770 7472 5f5f 3973 7472 6561 6162 7566 4676 2065 6770 7472 5f5f 3973 7472 6561 6d62 7566 4676 2065 6261
2147640 636b 5f5f 3973 7472 6561 6d62 7566 4676 2065 6275 665f 5f39 7374 7265 616d 6275 6646 7620 626c 656e 5f5f 3973 7472 6561
2147720 6d62 7566 4676 2073 6574 705f 5f39 7374 7265 616d 6275 6646 5063 5431 2073 6574 675f 5f39 7374 7265 616d 6275 6646 5063
2150000 4e32 3120 7062 756d 705f 5f39 7374 7265 616d 6275 6646 6920 5c00 6762 756d 705f 5f39 7374 7265 616d 6275 6646 6920 7365
2150060 7462 5f5f 3973 7472 6561 6d62 7566 4650 6354 3169 2075 6e62 7566 6665 7265 645f 5f39 7374 7265 616d 6275 6646 7620 756e
2150140 6275 6666 6572 6564 5f5f 3973 7472 6561 6d62 7566 4669 2061 6c6c 6f63 6174 655f 5f39 7374 7265 616d 6275 6646 7620 646f
2150220 616c 6c6f 6361 7465 5f5f 3973 7472 6561 6d62 7566 4676 206f 7665 7266 6c6f 775f 5f39 7374 7265 616d 6275 6646 6920 756e
2150300 6465 7266 6c6f 775f 5f39 7374 7265 616d 6275 6646 7620 5c00 7062 6163 6b66 6169 6c5f 5f39 7374 7265 616d 6275 6646 6920
2150360 7379 6e63 5f5f 3973 7472 6561 6d62 7566 4676 2073 6565 6b6f 6666 5f5f 3973 7472 6561 6d62 7566 466c 3873 6565 6b5f 6469
2150440 7269 2073 6565 6b70 6f73 5f5f 3973 7472 6561 6162 7566 466c 6920 7873 7075 746e 5f5f 3973 7472 6561 6d62 7566 4650 4363
2150520 6920 7873 6765 746e 5f5f 3973 7472 6561 6d62 7566 4650 6369 2069 6e5f 6176 6169 6c5f 5f39 7374 7265 616d 6275 6646 7620
2150600 6f75 745f 7761 6374 696e 675f 5f39 7374 7265 616d 6275 6646 7620 5c00 7367 6574 635f 5f39 7374 7265 616d 6275 6646 7620
2150660 736e 6578 7463 5f5f 3973 7472 6561 6d62 7566 4676 2073 6275 6d70 635f 5f39 7374 7265 616d 6275 6646 7620 7374 6f73 7363
2150740 5f5f 3973 7472 6561 6d62 7566 4676 2073 7075 7462 6163 6b63 5f5f 3973 7472 6561 6d62 7566 4663 2073 7075 7463 5f5f 3973
2151020 7472 6561 6d62 7566 4669 2073 7075 746e 5f5f 3973 7472 6561 6162 7566 4650 4363 6920 7367 6574 6e5f 5f39 7374 7265 616d
```

| | | | | | | | | | | | | | | | | | | | | | | | | |
|---|---|---|---|---|---|---|---|---|---|---|---|---|---|---|---|---|---|---|---|---|---|---|---|---|
| 2151100 | 6275 | 6646 | 5063 | 6920 | 7365 | 7462 | 7566 | 5f5f | 3973 | 7472 | 6561 | 6d62 | 7566 | 4650 | 6369 | 205c | 0073 | 6574 | 6275 | 665f | 5f39 | 7374 | 7265 | 616d |
| 2151160 | 6275 | 6646 | 5055 | 6369 | 2073 | 6574 | 6275 | 665f | 5f39 | 7374 | 7265 | 616d | 6275 | 6646 | 5063 | 6954 | 3220 | 5f5f | 6474 | 5f5f | 3973 | 7472 | 6561 | 6d62 |
| 2151240 | 7566 | 4676 | 2078 | 5f73 | 6e65 | 7874 | 635f | 5f39 | 7374 | 7265 | 616d | 6275 | 6646 | 7620 | 3b3b | 3b00 | 6973 | 7472 | 6561 | 6d3a | 5428 | 302c | 3332 | 293d |
| 2151320 | 7337 | 3278 | 5f67 | 636f | 756e | 745f | 5f37 | 6973 | 7472 | 6561 | 6d3a | 2830 | 2c31 | 292c | 302c | 3332 | 3b5f | 5f76 | 7074 | 725f | 5f37 | 6973 | 7472 | 6561 |
| 2151400 | 6d3a | 2830 | 2c33 | 3029 | 2c33 | 322c | 3332 | 3b50 | 696f | 733a | 2830 | 2c33 | 3329 | 3d2a | 2830 | 2c32 | 3329 | 2c36 | 342c | 3332 | 3b4f | 696f | 733a | 2830 |
| 2151460 | 2c32 | 3329 | 2c39 | 362c | 3438 | 303b | 3b00 | 6973 | 7472 | 6561 | 6d3a | 5a63 | 6973 | 7472 | 6561 | 6d3b | 696f | 733b | 5f5f | 6374 | 5f5f | 3769 | 7374 | 7265 |
| 2151540 | 616d | 4650 | 3973 | 7472 | 6561 | 6d62 | 7566 | 205f | 5f63 | 745f | 5f37 | 6973 | 7472 | 6561 | 6d46 | 7620 | 5f5f | 6374 | 5f5f | 3769 | 7374 | 7265 | 616d | 4650 |
| 2151620 | 3973 | 7472 | 6561 | 6d62 | 7566 | 6950 | 376f | 7374 | 7265 | 616d | 205f | 5f63 | 745f | 5f37 | 6973 | 7472 | 6561 | 6d46 | 6950 | 6354 | 3120 | 5f5f | 6374 | 5f5f |
| 2151700 | 3769 | 7374 | 7265 | 616d | 4669 | 5431 | 5037 | 6f73 | 7472 | 6561 | 6d20 | 5f5f | 6374 | 5f5f | 3769 | 7374 | 7265 | 616d | 4652 | 3769 | 7374 | 7265 | 616d | 205f |
| 2151760 | 5f64 | 745f | 5f37 | 6973 | 7472 | 6561 | 6d46 | 7620 | 5c00 | 6970 | 6678 | 5f5f | 3769 | 7374 | 7265 | 616d | 4669 | 2069 | 7366 | 785f | 5f37 | 6973 | 7472 | 6561 |
| 2152040 | 6d46 | 7620 | 7365 | 656b | 675f | 5f37 | 6973 | 7472 | 6561 | 6d46 | 6c20 | 7365 | 656b | 675f | 5f37 | 6973 | 7472 | 6561 | 6d46 | 6c38 | 7365 | 656b | 5f64 | 6972 |
| 2152120 | 2074 | 656c | 6c67 | 5f5f | 3769 | 7374 | 7265 | 616d | 4676 | 205f | 5f72 | 735f | 5f37 | 6973 | 7472 | 6561 | 6d46 | 5046 | 5237 | 6973 | 7472 | 6561 | 6d5f | 5237 |
| 2152200 | 6973 | 7472 | 6561 | 6d20 | 5f5f | 7273 | 5f5f | 3769 | 7374 | 7265 | 616d | 4650 | 4652 | 3369 | 6f73 | 5f52 | 3369 | 6f73 | 205f | 5f72 | 735f | 5f37 | 6973 | 7472 |
| 2152260 | 6561 | 6d46 | 5063 | 205f | 5f72 | 735f | 5f37 | 6973 | 7472 | 6561 | 6d46 | 5055 | 6320 | 5c00 | 5f5f | 7273 | 5f5f | 3769 | 7374 | 7265 | 616d | 4652 | 5563 | 205f |
| 2152340 | 5f72 | 735f | 5f37 | 6973 | 7472 | 6561 | 6146 | 5263 | 205f | 5f72 | 735f | 5f37 | 6973 | 7472 | 6561 | 6d46 | 5273 | 205f | 5f72 | 735f | 5f37 | 6973 | 7472 | 6561 |
| 2152420 | 6d46 | 5269 | 205f | 5f72 | 735f | 5f37 | 6973 | 7472 | 6561 | 6d46 | 526c | 205f | 5f72 | 735f | 5f37 | 6973 | 7472 | 6561 | 6d46 | 5255 | 7320 | 5f5f | 7273 | 5f5f |
| 2152500 | 3769 | 7374 | 7265 | 616d | 4652 | 5569 | 205f | 5f72 | 735f | 5f37 | 6973 | 7472 | 6561 | 6d46 | 5255 | 6c20 | 5f5f | 7273 | 5f5f | 3769 | 7374 | 7265 | 616d | 4652 |
| 2152560 | 6620 | 5f5f | 7273 | 5f5f | 3769 | 7374 | 7265 | 616d | 4652 | 6420 | 5f5f | 7273 | 5f5f | 3769 | 7374 | 7265 | 616d | 4650 | 3973 | 7472 | 6561 | 6d62 | 7566 | 205c |
| 2152640 | 0067 | 6574 | 5f5f | 3769 | 7374 | 7265 | 616d | 4650 | 6369 | 6320 | 6765 | 745f | 5f37 | 6973 | 7472 | 6561 | 6d46 | 5055 | 6369 | 6320 | 6765 | 745f | 5f37 | 6973 |
| 2152720 | 7472 | 6561 | 6d46 | 5239 | 7374 | 7265 | 616d | 6275 | 6663 | 2067 | 6574 | 5f5f | 3769 | 7374 | 7265 | 616d | 4652 | 5563 | 2067 | 6574 | 5f5f | 3769 | 7374 | 7265 |
| 2153000 | 616d | 4652 | 6320 | 6765 | 745f | 5f37 | 6973 | 7472 | 6561 | 6d46 | 7620 | 6765 | 746c | 696e | 655f | 5f37 | 6973 | 7472 | 6561 | 6d46 | 5063 | 6963 | 2067 | 6574 |
| 2153060 | 6c69 | 6e65 | 5f5f | 3769 | 7374 | 7265 | 616d | 4650 | 5563 | 6963 | 2070 | 6565 | 6b5f | 5f37 | 6973 | 7472 | 6561 | 6d46 | 7620 | 6967 | 6e6f | 7265 | 5f5f | 3769 |
| 2153140 | 7374 | 7265 | 616d | 4669 | 5431 | 205c | 0072 | 6561 | 645f | 5f37 | 6973 | 7472 | 6561 | 6d46 | 5063 | 6920 | 7265 | 6164 | 5f5f | 3769 | 7374 | 7265 | 616d | 4650 |
| 2153220 | 5563 | 6920 | 6763 | 6f75 | 6e74 | 5f5f | 3769 | 7374 | 7265 | 616d | 4676 | 2070 | 7574 | 6261 | 636b | 5f5f | 3769 | 7374 | 7265 | 616d | 4663 | 2073 | 796e | 635f |
| 2153300 | 5f37 | 6973 | 7472 | 6561 | 6d46 | 7620 | 646f | 5f69 | 7066 | 785f | 5f37 | 6973 | 7472 | 6561 | 6d46 | 6920 | 6561 | 7477 | 6869 | 7465 | 5f5f | 3769 | 7374 | 7265 |
| 2153360 | 616d | 4676 | 2078 | 6765 | 745f | 5f37 | 6973 | 7472 | 6561 | 6d46 | 5063 | 203b | 3b3b | 006f | 7374 | 7265 | 616d | 3a54 | 2830 | 2c32 | 3629 | 3d73 | 3638 | 5f5f |
| 2153440 | 7670 | 7472 | 5f5f | 376f | 7374 | 7265 | 616d | 3a28 | 302c | 3330 | 292c | 302c | 3332 | 3b50 | 696f | 733a | 2830 | 2c33 | 3329 | 2c33 | 322c | 3332 | 3b4f | 696f |
| 2153520 | 733a | 2830 | 2c32 | 3329 | 2c36 | 342c | 3438 | 303b | 3b00 | 6f73 | 7472 | 6561 | 6d3a | 5a63 | 6f73 | 7472 | 6561 | 6d3b | 696f | 733b | 5f5f | 6374 | 5f5f | 376f |
| 2153600 | 7374 | 7265 | 616d | 4650 | 3973 | 7472 | 6561 | 6d62 | 7566 | 205f | 5f63 | 745f | 5f37 | 6f73 | 7472 | 6561 | 6d46 | 7620 | 5f5f | 6374 | 5f5f | 376f | 7374 | 7265 |
| 2153660 | 616d | 4669 | 205f | 5f63 | 745f | 5f37 | 6f73 | 7472 | 6561 | 6d46 | 6950 | 6320 | 5f5f | 6374 | 5f5f | 376f | 7374 | 7265 | 616d | 4652 | 376f | 7374 | 7265 | 616d |
| 2153740 | 205f | 5f64 | 745f | 5f37 | 6f73 | 7472 | 6561 | 6d46 | 7620 | 6f70 | 6678 | 5f5f | 376f | 7374 | 7265 | 616d | 4676 | 206f | 7366 | 785f | 5f37 | 6f73 | 7472 | 6561 |
| 2154020 | 6d46 | 7620 | 666c | 7573 | 685f | 5f37 | 6f73 | 7472 | 6561 | 6d46 | 7620 | 5c00 | 7365 | 656b | 705f | 5f37 | 6f73 | 7472 | 6561 | 6d46 | 6c20 | 7365 | 656b | 705f |
| 2154100 | 5f37 | 6f73 | 7472 | 6561 | 6d46 | 6c38 | 7365 | 656b | 5f64 | 6972 | 2074 | 656c | 6c70 | 5f5f | 376f | 7374 | 7265 | 616d | 4676 | 2070 | 7574 | 5f5f | 376f | 7374 |
| 2154160 | 7265 | 616d | 4663 | 205f | 5f6c | 735f | 5f37 | 6f73 | 7472 | 6561 | 6d46 | 6320 | 5f5f | 6c73 | 5f5f | 376f | 7374 | 7265 | 616d | 4655 | 6320 | 5f5f | 6c73 | 5f5f |
| 2154240 | 376f | 7374 | 7265 | 616d | 4650 | 4363 | 205f | 5f6c | 735f | 5f37 | 6f73 | 7472 | 6561 | 6d46 | 6920 | 5f5f | 6c73 | 5f5f | 376f | 7374 | 7265 | 616d | 466c | 205f |
| 2154320 | 5f6c | 735f | 5f37 | 6f73 | 7472 | 6561 | 6d46 | 6420 | 5f5f | 6c73 | 5f5f | 376f | 7374 | 7265 | 616d | 4666 | 205c | 005f | 5f6c | 735f | 5f37 | 6f73 | 7472 | 6561 |
| 2154400 | 6d46 | 5569 | 205f | 5f6c | 735f | 5f37 | 6f73 | 7472 | 6561 | 6d46 | 556c | 205f | 5f6c | 735f | 5f37 | 6f73 | 7472 | 6561 | 6d46 | 5076 | 205f | 5f6c | 735f | 5f37 |
| 2154460 | 6f73 | 7472 | 6561 | 6d46 | 5039 | 7374 | 7265 | 616d | 6275 | 6620 | 5f5f | 6c73 | 5f5f | 376f | 7374 | 7265 | 616d | 4673 | 205f | 5f6c | 735f | 5f37 | 6f73 | 7472 |
| 2154540 | 6561 | 6d46 | 5573 | 205f | 5f6c | 735f | 5f37 | 6f73 | 7472 | 6561 | 6d46 | 5046 | 5237 | 6f73 | 7472 | 6561 | 6d5f | 5237 | 6f73 | 7472 | 6561 | 6d20 | 5f5f | 6c73 |
| 2154620 | 5f5f | 376f | 7374 | 7265 | 616d | 4650 | 4652 | 3369 | 6f73 | 5f52 | 3369 | 6f73 | 2077 | 7269 | 7465 | 5f5f | 376f | 7374 | 7265 | 616d | 4650 | 4363 | 6920 | 5c00 |
| 2154700 | 7772 | 6974 | 655f | 5f37 | 6f73 | 7472 | 6561 | 6d46 | 5043 | 5563 | 6920 | 646f | 5f6f | 7066 | 785f | 5f37 | 6f73 | 7472 | 6561 | 6d46 | 7620 | 646f | 5f6f | 7366 |
| 2154760 | 785f | 5f37 | 6f73 | 7472 | 6561 | 6d46 | 7620 | 3b3b | 3b00 | 7075 | 745f | 5f37 | 6f73 | 7472 | 6561 | 6d46 | 633a | 6628 | 302c | 3334 | 293d | 2a28 | 302c | 3236 |
| 2155040 | 2930 | 5f5f | 3074 | 6869 | 733a | 7028 | 302c | 3334 | 2900 | 5f5f | 3063 | 3a70 | 2830 | 2c32 | 2900 | 2f75 | 7372 | 2f43 | 432f | 7375 | 6e34 | 2f69 | 6e63 | 6c2f |
| 2155120 | 696f | 7374 | 7265 | 616d | 2e68 | 005f | 5f30 | 7468 | 6973 | 3a72 | 2830 | 2c33 | 3429 | 005f | 5f30 | 7468 | 6973 | 203a | 5a74 | 6c00 | 5f5f | 3063 | 203a | 5a74 |
| 2155200 | 6c00 | 7075 | 745f | 5f37 | 6f73 | 7472 | 6561 | 6146 | 6320 | 3a5a | 7446 | 0069 | 6f73 | 7472 | 6561 | 6d3a | 5428 | 302c | 3335 | 293d | 7338 | 3078 | 5f67 | 636f |
| 2155260 | 756e | 745f | 5f37 | 6973 | 7472 | 6561 | 6d3a | 2830 | 2c31 | 292c | 302c | 3332 | 3b5f | 5f76 | 7074 | 725f | 5f37 | 6973 | 7472 | 6561 | 6d3a | 2830 | 2c33 | 3029 |
| 2155340 | 2c33 | 322c | 3332 | 3b50 | 696f | 733a | 2830 | 2c33 | 3329 | 2c36 | 342c | 3332 | 3b4f | 6f73 | 7472 | 6561 | 6d3a | 2830 | 2c32 | 3629 | 2c39 | 362c | 3534 | 343b |
| 2155420 | 3b00 | 696f | 7374 | 7265 | 616d | 3a5a | 6369 | 6f73 | 7472 | 6561 | 6d3b | 6973 | 7472 | 6561 | 6d20 | 6f73 | 7472 | 6561 | 6d20 | 696f | 733b | 5f5f | 6374 | 5f5f |
| 2155500 | 3869 | 6f73 | 7472 | 6561 | 6d46 | 5039 | 7374 | 7265 | 616d | 6275 | 6620 | 5f5f | 6374 | 5f5f | 3869 | 6f73 | 7472 | 6561 | 6d46 | 7620 | 5f5f | 6374 | 5f5f | 3869 |
| 2155560 | 6f73 | 7472 | 6561 | 6146 | 5238 | 696f | 7374 | 7265 | 616d | 205f | 5f64 | 745f | 5f38 | 696f | 7374 | 7265 | 616d | 4676 | 203b | 3b3b | 0063 | 696e | 3a47 | 2830 |
| 2155640 | 2c33 | 3629 | 3d78 | 7369 | 7374 | 7265 | 616d | 5f77 | 6974 | 6861 | 7373 | 6967 | 6e3a | 0063 | 6f75 | 743a | 4728 | 302c | 3337 | 293d | 7873 | 6f73 | 7472 | 6561 |
| 2155720 | 6d5f | 7769 | 7468 | 6173 | 7369 | 676e | 3a00 | 6365 | 7272 | 3a47 | 2830 | 2c33 | 3729 | 0063 | 6c6f | 673a | 4728 | 302c | 3337 | 2900 | 496f | 7374 | 7265 | 616d |
| 2156000 | 5f69 | 6e69 | 743a | 5428 | 302c | 3338 | 293d | 7331 | 5f5f | 5739 | 5f5f | 3133 | 496f | 7374 | 7265 | 616d | 5f69 | 6e69 | 743a | 2830 | 2c32 | 292c | 302c | 383b |
| 2156060 | 3b00 | 7374 | 6473 | 7461 | 7475 | 735f | 5f31 | 3349 | 6f73 | 7472 | 6561 | 6d5f | 696e | 6974 | 3a47 | 2830 | 2c31 | 2900 | 696e | 6974 | 636f | 756e | 745f | 5f31 |
| 2156140 | 3349 | 6f73 | 7472 | 6561 | 6d5f | 696e | 6974 | 3a47 | 2830 | 2c31 | 2900 | 496f | 7374 | 7265 | 616d | 5f69 | 6e69 | 743a | 5a63 | 496f | 7374 | 7265 | 616d | 5f69 |

```
2156220 6e69 743b 3b5f 5f63 745f 5f31 3349 6f73 7472 6561 6d5f 696e 6974 4676 205f 5f64 745f 5f31 3349 6f73 7472 6561 6d5f 696e
2156300 6974 4676 203b 7374 6473 7461 7475 735f 5f31 3349 6f73 7472 6561 6d5f 696e 6974 2069 6e69 7463 6f75 6e74 5f5f 3133 496f
2156360 7374 7265 616d 5f69 6e69 7420 3b40 696f 733b 0069 6f73 7472 6561 6d5f 696e 6974 3a53 2830 2c33 3829 0047 5054 3a74 2830
2156440 2c31 3329 0073 6d61 6e69 705f 696e 743a 5428 302c 3339 293d 7338 6663 745f 5f31 3073 6d61 6e69 705f 696e 743a 2830 2c34
2156520 3029 3d2a 2830 2c34 3129 3d66 2830 2c33 3329 2c30 2c33 323b 6172 675f 5f31 3073 6d61 6e69 705f 696e 743a 2830 2c31 292c
2156600 3332 2c33 323b 3b00 736d 616e 6970 5f69 6e74 3a5a 6373 6d61 6e69 705f 696e 743b 3b5f 5f63 745f 5f31 3073 6d61 6e69 705f
2156660 696e 7446 5046 5233 696f 7369 5f52 3369 6f73 6920 3b3b 5f5f 6c73 5f5f 4652 376f 7374 7265 616d 5231 3073 6d61 6e69 705f
2156740 696e 7420 5f5f 7273 5f5f 4652 3769 7374 7265 616d 5231 3073 6d61 6e69 705f 696e 7420 3b00 7361 7070 6c79 5f69 6e74 3a54
2157020 2830 2c34 3229 3173 3466 6374 5f5f 3130 7361 7070 6c79 5f69 6e74 3a28 302c 3430 292c 302c 3332 3b3b 0073 6170 706c 795f
2157100 696e 743a 5a63 7361 7070 6c79 5f69 6e74 3b3b 5f5f 6374 5f5f 3130 7361 7070 6c79 5f69 6e74 4650 4652 3369 6f73 695f 5233
2157160 696f 7320 5f5f 636c 5f5f 3130 7361 7070 6c79 5f69 6e74 4669 203b 3b3b 0069 6d61 6e69 705f 696e 743a 5428 302c 3433 293d
2157240 7338 6663 745f 5f31 3069 6d61 6e69 705f 696e 743a 2830 2c34 3429 3d2a 2830 2c34 3529 3d66 2830 2c34 3629 3d2a 2830 2c33
2157320 3229 2c30 2c33 323b 6172 675f 5f31 3069 6d61 6e69 705f 696e 743a 2830 2c31 292c 3332 2c33 323b 3b00 696d 616e 6970 5f69
2157400 6e74 3a5a 6369 6161 6e69 705f 696e 743b 3b5f 5f63 745f 5f31 3069 6d61 6e69 705f 696e 7446 5046 5237 6973 7472 6561 6d69
2157460 5f52 3769 7374 7265 616d 6920 3b3b 5f5f 7273 5f5f 4652 3769 7374 7265 616d 5231 3069 6d61 6e69 705f 696e 7420 3b00 6961
2157540 7070 6c79 5f69 6e74 3a54 2830 2c34 3729 3d73 3466 6374 5f5f 3130 6961 7070 6c79 5f69 6e74 3a28 302c 3434 292c 302c 3332
2157620 3b3b 0069 6170 706c 795f 696e 743a 5a63 6961 7070 6c79 5f69 6e74 3b3b 5f5f 6374 5f5f 3130 6961 7070 6c79 5f69 6e74 4650
2157700 4652 3769 7374 7265 616d 695f 5237 6973 7472 6561 6d20 5f5f 636c 5f5f 3130 6961 7070 6c79 5f69 6e74 4669 203b 3b3b 006f
2157760 6d61 6e69 705f 696e 743a 5428 302c 3438 293d 7338 6663 745f 5f31 306f 6d61 6e69 705f 696e 743a 2830 2c34 3929 3d2a 2830
2160040 2c35 3029 3d66 2830 2c33 3429 2c30 2c33 323b 6172 675f 5f31 306f 6d61 6e69 705f 696e 743a 2830 2c31 292c 3332 2c33 323b
2160120 3b00 6f6d 616e 6970 5f69 6e74 3a5a 636f 6d61 6e69 705f 696e 743b 3b5f 5f63 745f 5f31 306f 6d61 6e69 705f 696e 7446 5046
2160200 5237 6f73 7472 6561 6d69 5f52 376f 7374 7265 616d 6920 3b3b 5f5f 6c73 5f5f 4652 376f 7374 7265 616d 5231 306f 6d61 6e69
2160260 705f 696e 7420 3b00 6f61 7070 6c79 5f69 6e74 3a54 2830 2c35 3129 3d73 3466 6374 5f5f 3130 6f61 7070 6c79 5f69 6e74 3a28
2160340 302c 3439 292c 302c 3332 3b3b 006f 6170 706c 795f 696e 743a 5a63 6f61 7070 6c79 5f69 6e74 3b3b 5f5f 6374 5f5f 3130 6f61
2160420 7070 6c79 5f69 6e74 4650 4652 376f 7374 7265 616d 695f 5237 6f73 7472 6561 6d20 5f5f 636c 5f5f 3130 6f61 7070 6c79 5f69
2160500 6e74 4669 203b 3b3b 0069 6f6d 616e 6970 5f69 6e74 3a54 2830 2c35 3229 3d73 3866 6374 5f5f 3131 696f 6d61 6e69 705f 696e
2160560 743a 2830 2c35 3329 3d2a 2830 2c35 3429 3d66 2830 2c35 3529 3d2a 2830 2c33 3529 2c30 2c33 323b 6172 675f 5f31 3169 6f6d
2160640 616e 6970 5f69 6e74 3a28 302c 3129 2c33 322c 3332 3b3b 0069 6f6d 616e 6970 5f69 6e74 3a5a 6369 6f6d 616e 6970 5f69 6e74
2160720 3b3b 5f5f 6374 5f5f 3131 696f 6d61 6e69 705f 696e 7446 5046 5238 696f 7374 7265 616d 695f 5238 696f 7374 7265 616d 6920
2161000 3b3b 5f5f 6c73 5f5f 4652 3869 6f73 7472 6561 6d52 3131 696f 6d61 6e69 705f 696e 7420 5f5f 7273 5f5f 4652 3869 6f73 7472
2161060 6561 6d52 3131 696f 6d61 6e69 705f 696e 7420 3b00 696f 6170 706c 795f 696e 743a 5428 302c 3536 293d 7334 6663 745f 5f31
2161140 3169 6f61 7070 6c79 5f69 6e74 3a28 302c 3533 292c 302c 3332 3b3b 0069 6f61 7070 6c79 5f69 6e74 3a5a 6369 6f61 7070 6c79
2161220 5f69 6e74 3b3b 5f5f 6374 5f5f 3131 696f 6170 706c 795f 696e 7446 5046 5238 696f 7374 7265 616d 695f 5238 696f 7374 7265
2161300 616d 205f 5f63 6c5f 5f31 3169 6f61 7070 6c79 5f69 6e74 4669 203b 3b3b 0073 6d61 6e69 705f 6c6f 6e67 3a54 2830 2c35 3729
2161360 3d73 3866 6374 5f5f 3131 736d 616e 6970 5f6c 6f6e 673a 2830 2c34 3029 2c30 2c33 323b 6172 675f 5f31 3173 6d61 6e69 705f
2161440 6c6f 6e67 3a28 302c 3129 2c33 322c 3332 3b3b 0073 6d61 6e69 705f 6c6f 6e67 3a5a 6373 6d61 6e69 705f 6c6f 6e67 3b3b 5f5f
2161520 6374 5f5f 3131 736d 616e 6970 5f6c 6f6e 6746 5046 5233 696f 736c 5f52 3369 6f73 6c20 3b3b 5f5f 6c73 5f5f 4652 376f 7374
2161600 7265 616d 5231 3173 6d61 6e69 705f 6c6f 6e67 205f 5f72 735f 5f46 5237 6973 7472 6561 6d52 3131 736d 616e 6970 5f6c 6f6e
2161660 6720 3b00 7361 7070 6c79 5f6c 6f6e 673a 5428 302c 3538 293d 7334 6663 745f 5f31 3173 6170 706c 795f 6c6f 6e67 3a28 302c
2161740 3430 292c 302c 3332 3b3b 0073 6170 706c 795f 6c6f 6e67 3a5a 6373 6170 706c 795f 6c6f 6e67 3b3b 5f5f 6374 5f5f 3131 7361
2162020 7070 6c79 5f6c 6f6e 6746 5046 5233 696f 736c 5f52 3369 6f73 205f 5f63 6c5f 5f31 3173 6170 706c 795f 6c6f 6e67 466c 203b
2162100 3b3b 0069 6d61 6e69 705f 6c6f 6e67 3a54 2830 2c35 3929 3d73 3866 6374 5f5f 3131 696d 616e 6970 5f6c 6f6e 673a 2830 2c34
2162160 3429 2c30 2c33 323b 6172 675f 5f31 3169 6d61 6e69 705f 6c6f 6e67 3a28 302c 3129 2c33 322c 3332 3b3b 0069 6d61 6e69 705f
2162240 6c6f 6e67 3a5a 6369 6d61 6e69 705f 6c6f 6e67 3b3b 5f5f 6374 5f5f 3131 696d 616e 6970 5f6c 6f6e 6746 5046 5237 6973 7472
2162320 6561 6d6c 5f52 3769 7374 7265 616d 6c20 3b3b 5f5f 7273 5f5f 4652 3769 7374 7265 616d 5231 3169 6d61 6e69 705f 6c6f 6e67
2162400 203b 0069 6170 706c 795f 6c6f 6e67 3a54 2830 2c36 3029 3d73 3466 6374 5f5f 3131 6961 7070 6c79 5f6c 6f6e 673a 2830 2c34
2162460 3429 2c30 2c33 323b 3b00 6961 7070 6c79 5f6c 6f6e 673a 5a63 6961 7070 6c79 5f6c 6f6e 673b 3b5f 5f63 745f 5f31 3169 6170
2162540 706c 795f 6c6f 6e67 4650 4652 3769 7374 7265 616d 6c5f 5237 6973 7472 6561 6d20 5f5f 636c 5f5f 3131 6961 7070 6c79 5f6c
2162620 6f6e 6746 6c20 3b3b 3b00 6f6d 616e 6970 5f6c 6f6e 673a 5428 302c 3631 293d 7338 6663 745f 5f31 316f 6d61 6e69 705f 6c6f
2162700 6e67 3a28 302c 3439 292c 302c 3332 3b61 7267 5f5f 3131 6f6d 616e 6970 5f6c 6f6e 673a 2830 2c31 292c 3332 2c33 323b 3b00
2162760 6f6d 616e 6970 5f6c 6f6e 673a 5a63 6f6d 616e 6970 5f6c 6f6e 673b 3b5f 5f63 745f 5f31 316f 6d61 6e69 705f 6c6f 6e67 4650
2163040 4652 376f 7374 7265 616d 6c5f 5237 6f73 7472 6561 6d6c 203b 3b5f 5f6c 735f 5f46 5237 6f73 7472 6561 6d52 3131 6f6d 616e
2163120 6970 5f6c 6f6e 6720 3b00 6f61 7070 6c79 5f6c 6f6e 673a 5428 302c 3632 293d 7334 6663 745f 5f31 316f 6170 706c 795f 6c6f
2163200 6e67 3a28 302c 3439 292c 302c 3332 3b3b 006f 6170 706c 795f 6c6f 6e67 3a5a 636f 6170 706c 795f 6c6f 6e67 3b3b 5f5f 6374
2163260 5f5f 3131 6f61 7070 6c79 5f6c 6f6e 6746 5046 5237 6f73 7472 6561 6d6c 5f52 376f 7374 7265 616d 205f 5f63 6c5f 5f31 316f
```

```
2163340 6170 706c 795f 6c6f 6e67 466c 203b 3b3b 0069 6f6d 616e 6970 5f6c 6f6e 673a 5428 302c 3633 293d 7338 6663 745f 5f31 3269
2163420 6f6d 616e 6970 5f6c 6f6e 673a 2830 2c35 3329 2c30 2c33 323b 6172 675f 5f31 3269 6f6d 616e 6970 5f6c 6f6e 673a 2830 2c31
2163500 292c 3332 2c33 323b 3b00 696f 6d61 6e69 705f 6c6f 6e67 3a5a 6369 6f6d 616e 6970 5f6c 6f6e 673b 3b5f 5f63 745f 5f31 3269
2163560 6f6d 616e 6970 5f6c 6f6e 6746 5046 5238 696f 7374 7265 616d 6c5f 5238 696f 7374 7265 616d 6c20 3b3b 5f5f 6c73 5f5f 4652
2163640 3869 6f73 7472 6561 6d52 3132 696f 6d61 6e69 705f 6c6f 6e67 205f 5f72 735f 5f46 5238 696f 7374 7265 616d 5231 3269 6f6d
2163720 616e 6970 5f6c 6f6e 6720 3b00 696f 6170 706c 795f 6c6f 6e67 3a54 2830 2c36 3429 3d73 3466 6374 5f5f 3132 696f 6170 706c
2164000 795f 6c6f 6e67 3a28 302c 3533 292c 302c 3332 3b3b 0069 6f61 7070 6c79 5f6c 6f6e 673a 5a63 696f 6170 706c 795f 6c6f 6e67
2164060 3b3b 5f5f 6374 5f5f 3132 696f 6170 706c 795f 6c6f 6e67 4650 4652 3869 6f73 7472 6561 6d6c 5f52 3869 6f73 7472 6561 6d20
2164140 5f5f 636c 5f5f 3132 696f 6170 706c 795f 6c6f 6e67 466c 203b 3b3b 0065 7272 6e6f 3a47 2830 2c31 2900 7379 735f 6e65 7272
2164220 3a47 2830 2c31 2900 7374 6469 6f62 7566 3a54 2830 2c36 3629 3d73 3532 616c 6c6f 635f 5f39 7374 7265 616d 6275 663a 2830
2164300 2c34 292c 302c 3136 3b78 5f75 6e62 7566 5f5f 3973 7472 6561 6d62 7566 3a28 302c 3429 2c31 362c 3136 3b78 5f62 6173 655f
2164360 5f39 7374 7265 616d 6275 663a 2830 2c33 3129 2c33 322c 3332 3b78 5f70 6261 7365 5f5f 3973 7472 6561 6d62 7566 3a28 302c
2164440 3331 292c 3634 2c33 323b 785f 7070 7472 5f5f 3973 7472 6561 6d62 7566 3a28 302c 3331 292c 3936 2c33 323b 785f 6570 7074
2164520 725f 5f39 7374 7265 616d 6275 663a 2830 2c33 3129 2c31 3238 2c33 323b 785f 6770 7472 5f5f 3973 7472 6561 6d62 7566 3a28
2164600 302c 3331 292c 3136 302c 3332 3b78 5f65 6770 7472 5f5f 3973 7472 6561 6d62 7566 3a28 302c 3331 292c 3139 322c 3332 3b5c
2164660 0078 5f65 6261 636b 5f5f 3973 7472 6561 6d62 7566 3a28 302c 3331 292c 3232 342c 3332 3b78 5f62 6c65 6e5f 5f39 7374 7265
2164740 616d 6275 663a 2830 2c31 292c 3235 362c 3332 3b5f 5f76 7074 725f 5f39 7374 7265 616d 6275 663a 2830 2c33 3029 2c32 3838
2165020 2c33 323b 6670 5f5f 3873 7464 696f 6275 663a 2830 2c36 3729 342a 2830 2c36 3529 3d78 735f 696f 6275 663a 2c33 3230 2c33
2165100 323b 6c61 7374 5f6f 705f 5f38 7374 6469 6f62 7566 3a28 302c 3129 2c33 3532 2c33 323b 6275 665f 5f38 7374 6469 6f62 7566
2165160 3a28 302c 3638 293d 6172 2830 2c31 293b 303b 313b 2830 2c32 292c 3338 342c 3136 3b3b 0073 7464 696f 6275 663a 5a63 7374
2165240 6469 6f62 7566 3b73 7472 6561 6d62 7566 3b6f 7665 7266 6c6f 775f 5f38 7374 6469 6f62 7566 4669 2075 6e64 6572 666c 6f77
2165320 5f5f 3873 7464 696f 6275 6646 7620 7379 6e63 5f5f 3873 7464 696f 6275 6646 7620 7365 656b 6f66 665f 5f38 7374 6469 6f62
2165400 7566 466c 3873 6565 6b5f 6469 7269 2070 6261 636b 6661 696c 5f5f 3873 7464 696f 6275 6646 6920 5f5f 6374 5f5f 3873 7464
2165460 696f 6275 6646 5f36 5f69 6f62 7566 205f 5f63 745f 5f38 7374 6469 6f62 7566 4652 4338 7374 6469 6f62 7566 205c 0073 7464
2165540 696f 6669 6c65 5f5f 3873 7464 696f 6275 6646 7620 5f5f 6474 5f5f 3873 7464 696f 6275 6646 7620 3b3b 3b00 6669 6c65 6275
2165620 663a 5428 302c 3639 293d 7336 3461 6c6c 6f63 5f5f 3973 7472 6561 6d62 7566 3a28 302c 3429 2c30 2c31 363b 785f 756e 6275
2165700 665f 5f39 7374 7265 616d 6275 663a 2830 2c34 292c 3136 2c31 363b 785f 6261 7365 5f5f 3973 7472 6561 6d62 7566 3a28 302c
2165760 3331 292c 3332 2c33 323b 785f 7062 6173 655f 5f39 7374 7265 616d 6275 663a 2830 2c33 3129 2c36 342c 3332 3b78 5f70 7074
2166040 725f 5f39 7374 7265 616d 6275 663a 2830 2c33 3129 2c39 362c 3332 3b78 5f65 7070 7472 5f5f 3973 7472 6561 6d62 7566 3a28
2166120 302c 3331 292c 3132 382c 3332 3b78 5f67 7074 725f 5f39 7374 7265 616d 6275 663a 2830 2c33 3129 2c31 3630 2c33 323b 785f
2166200 6567 7074 725f 5f39 7374 7265 616d 6275 663a 2830 2c33 3129 2c31 3932 2c33 323b 5c00 785f 6562 6163 6b5f 5f39 7374 7265
2166260 616d 6275 663a 2830 2c33 3129 2c32 3234 2c33 323b 785f 626c 656e 5f5f 3973 7472 6561 6d62 7566 3a28 302c 3129 2c32 3536
2166340 2c33 323b 5f5f 7570 7472 5f5f 3973 7472 6561 6d62 7566 3a28 302c 3330 292c 3238 382c 3332 3b78 6664 5f5f 3766 696c 6562
2166420 7566 3a28 302c 3129 2c33 3230 2c33 323b 6d6f 6465 5f5f 3766 696c 6562 7566 3a28 302c 3129 2c33 3532 2c33 323b 6f70 656e
2166500 6564 5f5f 3766 696c 6562 7566 3a28 302c 3229 2c33 3834 2c38 3b6c 6173 745f 7365 656b 5f5f 3766 696c 6562 7566 3a28 302c
2166560 3129 2c34 3136 2c33 323b 696e 5f73 7461 7274 5f5f 3766 696c 6562 7566 3a28 302c 3331 292c 3434 382c 3332 3b6c 6168 6561
2166640 645f 5f37 6669 6c65 6275 663a 2830 2c36 3829 2c34 3830 2c31 363b 3b00 6f70 656e 7072 6f74 5f5f 3766 696c 6562 7566 3a47
2166720 2830 2c31 2900 6669 6c65 6275 663a 5a63 6669 6c65 6275 663b 7374 7265 616d 6275 663b 5f5f 6374 5f5f 3766 696c 6562 7566
2167000 4676 205f 5f63 745f 5f37 6669 6c65 6275 6646 6920 5f5f 6374 5f5f 3766 696c 6562 7566 4669 5063 5431 205f 5f63 745f 5f37
2167060 6669 6c65 6275 6646 5243 3766 696c 6562 7566 2069 735f 6f70 656e 5f5f 3766 696c 6562 7566 4676 2066 645f 5f37 6669 6c65
2167140 6275 6646 7620 6f70 656e 5f5f 3766 696c 6562 7566 4650 4363 6954 3220 6174 7461 6368 5f5f 3766 696c 6562 7566 4669 2063
2167220 6c6f 7365 5f5f 3766 696c 6562 7566 4676 205c 005f 5f64 745f 5f37 6669 6c65 6275 6646 7620 6f76 6572 666c 6f77 5f5f 3766
2167300 696c 6562 7566 4669 2075 6e64 6572 666c 6f77 5f5f 3766 696c 6562 7566 4676 2073 796e 635f 5f37 6669 6c65 6275 6646 7620
2167360 7365 656b 6f66 665f 5f37 6669 6c65 6275 6646 6c38 7365 656b 5f64 6972 6920 7365 7462 7566 5f5f 3766 696c 6562 7566 4650
2167440 6369 206c 6173 745f 6f70 5f5f 3766 696c 6562 7566 4676 203b 6f70 656e 7072 6f74 5f5f 3766 696c 6562 7566 203b 3b00 6673
2167520 7472 6561 6d62 6173 653a 5428 302c 3730 293d 7331 3332 6275 665f 5f31 3166 7374 7265 616d 6261 7365 3a28 302c 3639 292c
2167600 302c 3531 323b 5f5f 7670 7472 5f5f 3131 6673 7472 6561 6d62 6173 653a 2830 2c33 3029 2c35 3132 2c33 323b 5069 6f73 3a28
2167660 302c 3333 292c 3534 342c 3332 3b4f 696f 733a 2830 2c32 3329 2c35 3736 2c34 3830 3b3b 0066 7374 7265 616d 6261 7365 3a5a
2167740 6366 7374 7265 616d 6261 7365 3b69 6f73 3b5f 5f63 745f 5f31 3166 7374 7265 616d 6261 7365 4676 205f 5f63 745f 5f31 3166
2170020 7374 7265 616d 6261 7365 4650 4363 6954 3220 5f5f 6374 5f5f 3131 6673 7472 6561 6d62 6173 6546 6920 5f5f 6374 5f5f 3131
2170100 6673 7472 6561 6d62 6173 6546 6950 6354 3120 5f5f 6374 5f5f 3131 6673 7472 6561 6d62 6173 6546 5231 3166 7374 7265 616d
2170160 6261 7365 205f 5f64 745f 5f31 3166 7374 7265 616d 6261 7365 4676 206f 7065 6e5f 5f31 3166 7374 7265 616d 6261 7365 4650
2170240 4363 6954 3220 5c00 6174 7461 6368 5f5f 3131 6673 7472 6561 6d62 6173 6546 6920 636c 6f73 655f 5f31 3166 7374 7265 616d
2170320 6261 7365 4676 2073 6574 6275 665f 5f31 3166 7374 7265 616d 6261 7365 4650 6369 2072 6462 7556 5f5f 3131 6673 7472 6561
2170400 6d62 6173 6546 7620 7665 7269 6679 5f5f 3131 6673 7472 6561 6d62 6173 6546 6920 3b3b 3b00 7374 6174 655f 7661 6c75 653a
```

```
2170460  7428 302c 3138 2900 5661 6c75 655f 5479 7065 3a54 2830 2c37 3129 3d65 554e 4b4e 4f57 4e56 3a30 2c53 5452 494e 473a 312c
2170540  494e 5445 4745 523a 322c 464c 4f41 543a 332c 3b00 426c 6f63 6b5f 5479 7065 3a54 2830 2c37 3229 3d65 554e 4b4e 4f57 4e42
2170620  3a30 2c45 4e54 4954 593a 312c 4655 4e43 5449 4f4e 3a32 2c50 524f 4345 4455 5245 3a33 2c3b 0045 6e74 6974 795f 5479 7065
2170700  3a54 2830 2c37 3329 3d65 554e 4b4e 4f57 4e45 3a30 2c41 5243 4849 5445 4354 5552 453a 312c 5355 4250 524f 4752 414d 3a32
2170760  2c3b 0050 696e 5f54 7970 653a 5428 302c 3734 293d 6555 4e4b 4e4f 574e 503a 302c 494e 5049 4e3a 312c 4f55 5450 494e 3a32
2171040  2c49 4e4f 5554 5049 4e3a 332c 3b00 5061 7261 5f43 6c61 7373 3a54 2830 2c37 3529 3d65 554e 4b4e 4f57 4e43 3a30 2c46 4f52
2171120  4d41 4c3a 312c 4143 5455 414c 3a32 2c52 4553 4f4c 5645 443a 332c 3b00 424f 4f4c 4541 4e3a 5428 302c 3736 293d 6546 616c
2171200  7365 3a30 2c54 7275 653a 312c 3b00 426f 6f6c 6561 6e3a 5428 302c 3737 293d 6566 616c 7365 3a30 2c74 7275 653a 312c 3b00
2171260  4275 6666 6572 3a47 2830 2c33 3129 004f 626a 6563 743a 5428 302c 3738 293d 7334 5f5f 7670 7472 5f5f 364f 626a 6563 743a
2171340  2830 2c33 3029 2c30 2c33 323b 3b00 4f62 6a65 6374 3a5a 634f 626a 6563 743b 3b5f 5f63 745f 5f36 4f62 6a65 6374 4676 205f
2171420  5f63 745f 5f36 4f62 6a65 6374 4652 4336 4f62 6a65 6374 2065 7272 6f72 4d65 6d6f 7279 5f5f 364f 626a 6563 7446 5063 5431
2171500  2065 7870 6c61 696e 5f5f 364f 626a 6563 7446 5063 2069 6e4f 7264 6572 5f5f 364f 626a 6563 7446 5036 4f62 6a65 6374 203b
2171560  3b3b 005f 5f70 7462 6c5f 5f36 4f62 6a65 6374 5f5f 4765 6e56 616c 7565 5f63 7878 3a47 2830 2c33 3029 0050 463a 7428 302c
2171640  3135 2900 5046 433a 7428 302c 3135 2900 5046 493a 7428 302c 3135 2900 4e4f 626a 6563 743a 5428 302c 3739 293d 7338 5f5f
2171720  7670 7472 5f5f 364f 626a 6563 743a 2830 2c33 3029 2c30 2c33 323b 6e61 6d65 5f5f 374e 4f62 6a65 6374 3a28 302c 3331 292c
2172000  3332 2c33 323b 3b00 4e4f 626a 6563 743a 5a63 4e4f 626a 6563 743b 4f62 6a65 6374 3b5f 5f63 745f 5f37 4e4f 626a 6563 7446
2172060  5063 205f 5f63 745f 5f37 4e4f 626a 6563 7446 5243 374e 4f62 6a65 6374 2073 6574 4e61 6d65 5f5f 374e 4f62 6a65 6374 4650
2172140  6320 6765 744e 616d 655f 5f37 4e4f 626a 6563 7446 7620 6578 706c 6169 6e5f 5f37 4e4f 626a 6563 7446 5063 2067 6574 4174
2172220  7472 5f5f 374e 4f62 6a65 6374 4669 2067 6574 5072 6f70 5f5f 374e 4f62 6a65 6374 4650 6369 2073 6574 5072 6f70 5f5f 374e
2172300  4f62 6a65 6374 4650 6354 3120 5c00 7365 7450 726f 705f 5f37 4e4f 626a 6563 7446 5063 6920 7365 7450 726f 705f 5f37 4e4f
2172360  626a 6563 7446 5063 6620 6973 4754 455f 5f37 4e4f 626a 6563 7446 5036 4f62 6a65 6374 2069 734c 5445 5f5f 374e 4f62 6a65
2172440  6374 4650 364f 626a 6563 7420 3b3b 3b00 6f73 7472 6561 6d5f 7769 7468 6173 7369 676e 3a54 2830 2c33 3729 3d73 3638 5f5f
2172520  7670 7472 5f5f 376f 7374 7265 616d 3a28 302c 3330 292c 302c 3332 3b50 696f 733a 2830 2c33 3329 2c33 322c 3332 3b4f 696f
2172600  733a 2830 2c32 3329 2c36 342c 3438 303b 3b00 6f73 7472 6561 6d5f 7769 7468 6173 7369 676e 3a5a 636f 7374 7265 616d 5f77
2172660  6974 6861 7373 6967 6e3b 6f73 7472 6561 6d20 696f 733b 5f5f 6374 5f5f 3138 6f73 7472 6561 6d5f 7769 7468 6173 7369 676e
2172740  4676 205f 5f63 745f 5f31 386f 7374 7265 616d 5f77 6974 6861 7373 6967 6e46 5231 386f 7374 7265 616d 5f77 6974 6861 7373
2173020  6967 6e20 5f5f 6474 5f5f 3138 6f73 7472 6561 6d5f 7769 7468 6173 7369 676e 4676 205f 5f61 735f 5f31 386f 7374 7265 616d
2173100  5f77 6974 6861 7373 6967 6e46 5237 6f73 7472 6561 6d20 5c00 5f5f 6173 5f5f 3138 6f73 7472 6561 6d5f 7769 7468 6173 7369
2173160  676e 4650 3973 7472 6561 6d62 7566 203b 3b3b 0050 4642 3a74 2830 2c31 3529 004c 4e4f 626a 6563 743a 5428 302c 3830 293d
2173240  7331 325f 5f76 7074 725f 5f36 4f62 6a65 6374 3a28 302c 3330 292c 302c 3332 3b6e 616d 655f 5f37 4e4f 626a 6563 743a 2830
2173320  2c33 3129 2c33 322c 3332 3b6e 6578 745f 5f38 4c4e 4f62 6a65 6374 3a28 302c 3831 293d 2a28 302c 3830 292c 3634 2c33 323b
2173400  3b00 4c4e 4f62 6a65 6374 3a5a 634c 4e4f 626a 6563 743b 4e4f 626a 6563 743b 5f5f 6374 5f5f 384c 4e4f 626a 6563 7446 5063
2173460  5038 4c4e 4f62 6a65 6374 205f 5f63 745f 5f38 4c4e 4f62 6a65 6374 4652 4338 4c4e 4f62 6a65 6374 2073 6574 4e65 7874 5f5f
2173540  384c 4e4f 626a 6563 7446 5038 4c4e 4f62 6a65 6374 2067 6574 4e65 7874 5f5f 384c 4e4f 626a 6563 7446 7620 3b3b 3b00 4c4f
2173620  626a 6563 743a 5428 302c 3832 293d 7338 5f5f 7670 7472 5f5f 364f 626a 6563 743a 2830 2c33 3029 2c30 2c33 323b 6e65 7874
2173700  5f5f 374c 4f62 6a65 6374 3a28 302c 3833 293d 2a28 302c 3832 292c 3332 2c33 323b 3b00 4c4f 626a 6563 743a 5a63 4c4f 626a
2173760  6563 743b 4f62 6a65 6374 3b5f 5f63 745f 5f37 4c4f 626a 6563 7446 5037 4c4f 626a 6563 7420 5f5f 6374 5f5f 374c 4f62 6a65
2174040  6374 4652 4337 4c4f 626a 6563 7420 7365 744e 6578 745f 5f37 4c4f 626a 6563 7446 5037 4c4f 626a 6563 7420 6765 744e 6578
2174120  745f 5f37 4c4f 626a 6563 7446 7620 3b3b 3b00 4c50 4f62 6a65 6374 3a54 2830 2c38 3429 3d73 3132 5f5f 7670 7472 5f5f 364f
2174200  626a 6563 743a 2830 2c33 3029 2c30 2c33 323b 6e65 7874 5f5f 374c 4f62 6a65 6374 3a28 302c 3833 292c 3332 2c33 323b 6e6f
2174260  626a 7074 725f 5f38 4c50 4f62 6a65 6374 3a28 302c 3835 293d 2a28 302c 3739 292c 3634 2c33 323b 3b00 4c50 4f62 6a65 6374
2174340  3a5a 634c 504f 626a 6563 743b 4c4f 626a 6563 743b 5f5f 6374 5f5f 384c 504f 626a 6563 7446 5037 4e4f 626a 6563 7450 374c
2174420  4f62 6a65 6374 205f 5f63 745f 5f38 4c50 4f62 6a65 6374 4652 4338 4c50 4f62 6a65 6374 2073 6574 4f62 6a65 6374 5f5f 384c
2174500  504f 626a 6563 7446 5037 4e4f 626a 6563 7420 6765 744f 626a 6563 745f 5f38 4c50 4f62 6a65 6374 4676 2065 7870 6c61 696e
2174560  5f5f 384c 504f 626a 6563 7446 5063 203b 3b3b 005f 5f70 7462 6c5f 5f38 4c50 4f62 6a65 6374 5f5f 4765 6e56 616c 7565 5f63
2174640  7878 3a47 2830 2c33 3029 005f 5f43 3434 3a54 2830 2c38 3629 3d75 3473 7661 6c75 653a 2830 2c33 3129 2c30 2c33 323b 6976
2174720  616c 7565 3a28 302c 3129 2c30 2c33 323b 6676 616c 7565 3a28 302c 3929 2c30 2c33 323b 3b00 5f5f 4334 343a 5a63 5f5f 4334
2175000  343b 3b3b 3b3b 0047 656e 5661 6c75 653a 5428 302c 3837 293d 7331 365f 5f76 7074 725f 5f36 4f62 6a65 6374 3a28 302c 3330
2175060  292c 302c 3332 3b6e 616d 655f 5f37 4e4f 626a 6563 743a 2830 2c33 3129 2c33 322c 3332 3b74 7970 655f 5f38 4765 6e56 616c
2175140  7565 3a28 302c 3731 292c 3634 2c33 323b 5f5f 4f34 345f 5f38 4765 6e56 616c 7565 3a28 302c 3836 292c 3936 2c33 323b 3b00
2175220  4765 6e56 616c 7565 3a5a 6347 656e 5661 6c75 653b 4e4f 626a 6563 743b 5f5f 6374 5f5f 3847 656e 5661 6c75 6546 7620 5f5f
2175300  6374 5f5f 3847 656e 5661 6c75 6546 5243 3847 656e 5661 6c75 6520 5f5f 6474 5f5f 3847 656e 5661 6c75 6546 7620 7365 745f
2175360  4765 6e56 616c 7565 5f74 7970 655f 5f38 4765 6e56 616c 7565 4650 6369 2073 6574 5f47 656e 5661 6c75 655f 7479 7065 5f5f
2175440  3847 656e 5661 6c75 6546 3130 5661 6c75 655f 5479 7065 2073 6574 5f47 656e 5661 6c75 655f 5f38 4765 6e56 616c 7565 4650
2175520  6320 5c00 7365 745f 4765 6e56 616c 7565 5f5f 3847 656e 5661 6c75 6546 6920 7365 745f 4765 6e56 616c 7565 5f5f 3847 656e
```

2175600 5661 6c75 6546 6620 6765 745f 4765 6e56 616c 7565 5f74 7970 655f 5f38 4765 6e56 616c 7565 4676 2067 6574 5f47 656e 5661
2175660 6c75 655f 735f 5f38 4765 6e56 616c 7565 4676 2067 6574 5f47 656e 5661 6c75 655f 695f 5f38 4765 6e56 616c 7565 4676 2067
2175740 6574 5f47 656e 5661 6c75 655f 665f 5f38 4765 6e56 616c 7565 4676 2065 7870 6c61 696e 5f5f 3847 656e 5661 6c75 6546 5063
2176020 205c 0063 6865 636b 5f5f 3847 656e 5661 6c75 6546 6920 3b3b 3b00 5f5f 7074 626c 5f5f 3847 656e 5661 6c75 655f 5f47 656e
2176100 5661 6c75 655f 6378 783a 4728 302c 3330 2900 6578 706c 6169 6e5f 5f38 4765 6e56 616c 7565 4650 633a 4628 302c 3229 005f
2176160 5f30 7468 6973 3a70 2830 2c38 3829 342a 2830 2c38 3729 005f 5f30 733a 7028 302c 3331 2900 4765 6e56 616c 7565 2e63 7878
2176240 005f 5f30 7468 6973 3a72 2830 2c38 3829 005f 5f30 7468 6973 203a 5a74 6c00 5f5f 3073 203a 5a74 6c00 6578 706c 6169 6e5f
2176320 5f38 4765 6e56 616c 7565 4650 6320 3a5a 7446 0073 6574 5f47 656e 5661 6c75 655f 7479 7065 5f5f 3847 656e 5661 6c75 6546
2176400 5063 693a 4628 302c 3229 005f 5f30 7468 6973 3a70 2830 2c38 3829 005f 5f30 733a 7028 302c 3331 2900 5f5f 3071 7569 6574
2176460 3a70 2830 2c31 2900 5f5f 3074 6869 733a 7228 302c 3838 2900 5f5f 3074 6869 7320 3a5a 746c 005f 5f30 7320 3a5a 746c 005f
2176540 5f30 7175 6965 7420 3a5a 746c 0073 6574 5f47 656e 5661 6c75 655f 7479 7065 5f5f 3847 656e 5661 6c75 6546 5063 6920 3a5a
2176620 7446 0063 6865 636b 5f5f 3847 656e 5661 6c75 6546 693a 4628 302c 3129 005f 5f30 7468 6973 3a70 2830 2c38 3929 005f 5f30
2176700 743a 7028 302c 3129 005f 5f30 7468 6973 203a 5a74 6c00 5f5f 3074 203a 5a74 6c00 6368 6563 6b5f 5f38 4765 6e56 616c 7565
2176760 4669 203a 5a74 4600 5f5f 7374 695f 5f47 656e 5661 6c75 655f 6378 785f 6578 706c 6169 6e5f 3a46 2830 2c32 2900 2f75 7372
2177040 2f43 432f 7375 6e34 2f69 6e63 6c2f 696f 7374 7265 616d 2e68 005f 5f73 7464 5f5f 4765 6e56 616c 7565 5f63 7878 5f65 7870
2177120 6c61 696e 5f3a 4628 302c 3229 005f 5f76 7462 6c5f 5f38 4765 6e56 616c 7565 3347 2830 2c38 3929 3d61 7228 302c 3129 3b30
2177200 3b31 303b 2830 2c31 3529 005f 5f76 7462 6c5f 5f38 4c50 4f62 6a65 6374 5f5f 4765 6e56 616c 7565 5f63 7878 3a47 2830 2c39
2177260 3029 3d61 7228 302c 3129 3b30 3b33 3b28 302c 3135 2900 6578 706c 6169 6e5f 5f38 4c50 4f62 6a65 6374 4650 633a 6628 302c
2177340 3229 005f 5f30 7468 6973 3a70 2830 2c39 3129 3d2a 2830 2c39 3429 005f 5f30 733a 7028 302c 3331 2900 2f68 6f6d 652f 6f73
2177420 6173 312f 612f 6162 2f73 7263 2f6e 6577 6f62 6a65 6374 732f 6878 782f 4c50 4f62 6a65 6374 5f64 622e 6878 7800 5f5f 3074
2177500 6869 733a 7228 302c 3931 2900 5f5f 3074 6869 7320 3a5a 746c 005f 5f30 7320 3a5a 746c 0065 7870 6c61 696e 5f5f 384c 504f
2177560 626a 6563 7446 5063 203a 5a74 4600 6973 4c54 455f 5f37 4e4f 626a 6563 7446 5036 4f62 6a65 6374 3a66 2830 2c31 2900 5f5f
2177640 3074 6869 733a 7028 302c 3835 2900 5f5f 305f 5f41 3339 3a70 2830 2c39 3229 3d2a 2830 2c37 3829 002f 686f 6d65 2f6f 7361
2177720 7331 2f61 2f61 622f 7372 632f 6e65 776f 626a 6563 7473 2f68 7878 2f4e 4f62 6a65 6374 5f64 622e 6878 7800 5f5f 3074 6869
2200000 7320 3a5a 746c 005f 5f30 5f5f 4133 3920 3a5a 746c 0069 734c 5445 5f5f 374e 4f62 6a65 6374 4650 364f 626a 6563 7420 3a5a
2200060 7446 0069 7347 5445 5f5f 374e 4f62 6a65 6374 4650 364f 626a 6563 743a 6628 302c 3129 005f 5f30 7468 6973 3a70 2830 2c38
2200140 3529 005f 5f30 5f5f 4133 383a 7028 302c 3932 2900 5f5f 3074 6869 7320 3a5a 746c 005f 5f30 5f5f 4133 3820 3a5a 746c 0069
2200220 7347 5445 5f5f 374e 4f62 6a65 6374 4650 364f 626a 6563 7420 3a5a 7446 0073 6574 5072 6f70 5f5f 374e 4f62 6a65 6374 4650
2200300 6366 3a66 2830 2c32 2900 5f5f 3074 6869 733a 7028 302c 3835 2900 5f5f 315f 5f41 3336 3a70 2830 2c33 3129 005f 5f31 5f5f
2200360 4133 373a 7028 302c 3130 2900 5f5f 3074 6869 7320 3a5a 746c 005f 5f31 5f5f 4133 3620 3a5a 746c 005f 5f31 5f5f 4133 3720
2200440 3a5a 746c 0073 6574 5072 6f70 5f5f 374e 4f62 6a65 6374 4650 6366 203a 5a74 4600 7365 7450 726f 705f 5f37 4e4f 626a 6563
2200520 7446 5063 693a 6628 302c 3229 005f 5f30 7468 6973 3a70 2830 2c38 3529 005f 5f31 5f5f 4133 343a 7028 302c 3331 2900 5f5f
2200600 315f 5f41 3335 3a70 2830 2c31 2900 5f5f 3074 6869 7320 3a5a 746c 005f 5f31 5f5f 4133 3420 3a5a 746c 005f 5f31 5f5f 4133
2200660 3520 3a5a 746c 0073 6574 5072 6f70 5f5f 374e 4f62 6a65 6374 4650 6369 203a 5a74 4600 7365 7450 726f 705f 5f37 4e4f 626a
2200740 6563 7446 5063 5431 3a66 2830 2c32 2900 5f5f 3074 6869 733a 7028 302c 3835 2900 5f5f 315f 5f41 3332 3a70 2830 2c33 3129
2201020 005f 5f31 5f5f 4133 333a 7028 302c 3331 2900 5f5f 3074 6869 7320 3a5a 746c 005f 5f31 5f5f 4133 3220 3a5a 746c 005f 5f31
2201100 5f5f 4133 3320 3a5a 746c 0073 6574 5072 6f70 5f5f 374e 4f62 6a65 6374 4650 6354 3120 3a5a 7446 0067 6574 5072 6f70 5f5f
2201160 374e 4f62 6a65 6374 4650 6369 3a66 2830 2c33 3129 005f 5f30 7468 6973 3a70 2830 2c38 3529 005f 5f30 5f5f 4133 303a 7028
2201240 302c 3331 2900 5f5f 305f 5f41 3331 3a70 2830 2c31 2900 5f5f 3074 6869 7320 3a5a 746c 005f 5f30 5f5f 4133 3020 3a5a 746c
2201320 005f 5f30 5f5f 4133 3120 3a5a 746c 0067 6574 5072 6f70 5f5f 374e 4f62 6a65 6374 4650 6369 203a 5a74 4600 6765 7441 7474
2201400 725f 5f37 4e4f 626a 6563 7446 693a 6628 302c 3331 2900 5f5f 3074 6869 733a 7028 302c 3835 2900 5f5f 305f 5f41 3239 3a70
2201460 2830 2c31 2900 5f5f 3074 6869 7320 3a5a 746c 005f 5f30 5f5f 4132 3920 3a5a 746c 0067 6574 4174 7472 5f5f 374e 4f62 6a65
2201540 6374 4669 203a 5a74 4600 696e 4f72 6465 725f 5f36 4f62 6a65 6374 4650 364f 626a 6563 743a 6628 302c 3129 005f 5f30 7468
2201620 6973 3a70 2830 2c39 3229 005f 5f30 5f5f 4132 373a 7028 302c 3932 2900 2f68 6f6d 652f 6f73 6173 312f 612f 6162 2f73 7263
2201700 2f6e 6577 6f62 6a65 6374 732f 6878 782f 4f62 6a65 6374 5f64 622e 6878 7800 5f5f 3074 6869 7320 3a5a 746c 005f 5f30 5f5f
2201760 4132 3720 3a5a 746c 0069 6e4f 7264 6572 5f5f 364f 626a 6563 7446 5036 4f62 6a65 6374 203a 5a74 4600 7061 7261 6d65 7465
2202040 722e 6f00 5f73 6574 5f70 6172 616d 6574 6572 5f76 616c 7565 5f74 7970 655f 5f39 7061 7261 6d65 7465 7246 5063 005f 7365
2202120 7450 726f 705f 5f37 4e4f 626a 6563 7446 5063 6600 5f73 6574 5072 6f70 5f5f 374e 4f62 6a65 6374 4650 6369 005f 6765 7441
2202200 7474 725f 5f37 4e4f 626a 6563 7446 6900 5f70 7574 5f5f 376f 7374 7265 616d 4663 005f 7365 7450 726f 705f 5f37 4e4f 626a
2202260 6563 7446 5063 5431 005f 696f 7374 7265 616d 5f69 6e69 7400 5f69 734c 5445 5f5f 374e 4f62 6a65 6374 4650 364f 626a 6563
2202340 7400 5f69 7347 5445 5f5f 374e 4f62 6a65 6374 4650 364f 626a 6563 7400 5f65 7870 6c61 696e 5f5f 384c 504f 626a 6563 7446
2202420 5063 005f 6765 7450 726f 705f 5f37 4e4f 626a 6563 7446 5063 6900 5f5f 5f63 745f 5f36 656e 7469 7479 4676 005f 696e 4f72
2202500 6465 725f 5f36 4f62 6a65 6374 4650 364f 626a 6563 7400 2f68 6f6d 652f 6f73 6173 312f 612f 6162 2f73 7263 2f6e 6577 6f62
2202560 6a65 6374 732f 7072 6f67 2f43 2b2b 2e32 3233 3534 2f00 7061 7261 6d65 7465 722e 6300 7061 7261 6d65 7465 722e 6378 7800
2202640 696e 743a 7428 302c 3129 3d72 2830 2c31 293b 2432 3134 3734 3833 3634 383b 3231 3437 3438 3336 3437 3b00 6368 6172 3a74

| | | | | | | | | | | | | | | | | | | | | | | | | |
|---|---|---|---|---|---|---|---|---|---|---|---|---|---|---|---|---|---|---|---|---|---|---|---|---|
| 2202720 | 2830 | 2c32 | 293d | 7228 | 302c | 3229 | 3b30 | 3b31 | 3237 | 3b00 | 6c6f | 6e67 | 3a74 | 2830 | 2c33 | 293d | 7228 | 302c | 3129 | 3b2d | 3231 | 3437 | 3438 | 3336 |
| 2203000 | 3438 | 3b32 | 3134 | 3734 | 3833 | 3634 | 373b | 0073 | 686f | 7274 | 3a74 | 2830 | 2c34 | 293d | 7228 | 302c | 3129 | 3b2d | 3332 | 3736 | 383b | 3332 | 3736 | 373b |
| 2203060 | 0075 | 6e73 | 6967 | 6e65 | 6420 | 6368 | 6172 | 3a74 | 2830 | 2c35 | 293d | 7228 | 302c | 3129 | 3b30 | 3b32 | 3535 | 3b00 | 756e | 7369 | 676e | 6564 | 2073 | 686f |
| 2203140 | 7274 | 3a74 | 2830 | 2c36 | 293d | 7228 | 302c | 3129 | 3b30 | 3b36 | 3535 | 3335 | 3b00 | 756e | 7369 | 676e | 6564 | 206c | 6f6e | 673a | 7428 | 302c | 3729 | 3d72 |
| 2203220 | 2830 | 2c31 | 293b | 303b | 2d31 | 3b00 | 756e | 7369 | 676e | 6564 | 2069 | 6e74 | 3a74 | 2830 | 2c38 | 293d | 7228 | 302c | 3129 | 3b33 | 3b2d | 313b | 0066 | 6c6f |
| 2203300 | 6174 | 3a74 | 2830 | 2c39 | 293d | 7228 | 302c | 3129 | 3b34 | 3b30 | 3b00 | 646f | 7562 | 6c65 | 3a74 | 2830 | 2c31 | 3029 | 3d72 | 2830 | 2c31 | 293b | 383b | 303b |
| 2203360 | 0076 | 6f69 | 643a | 7428 | 302c | 3131 | 293d | 2830 | 2c31 | 3129 | 003f | 3f3f | 3a74 | 2830 | 2c31 | 3229 | 3d28 | 302c | 3129 | 005f | 5f76 | 7074 | 703a | 7428 |
| 2203440 | 302c | 3133 | 293d | 2a28 | 302c | 3134 | 293d | 6628 | 302c | 3129 | 005f | 5f6d | 7074 | 723a | 5428 | 302c | 3135 | 293d | 7338 | 643a | 2830 | 2c34 | 292c | 302c |
| 2203520 | 3136 | 3b69 | 3a28 | 302c | 3429 | 2c31 | 362c | 3136 | 3b66 | 3a28 | 302c | 3133 | 292c | 3332 | 2c33 | 323b | 3b00 | 5f50 | 4656 | 5f3a | 7428 | 302c | 3136 | 293d |
| 2203600 | 2a28 | 302c | 3137 | 293d | 6628 | 302c | 3229 | 005f | 5046 | 495f | 3a74 | 2830 | 2c31 | 3329 | 0065 | 7272 | 6e6f | 3a47 | 2830 | 2c31 | 2900 | 7379 | 735f | 6e65 |
| 2203660 | 7272 | 3a47 | 2830 | 2c31 | 2900 | 656e | 7669 | 726f | 6e3a | 4728 | 302c | 3139 | 293d | 2a28 | 302c | 3230 | 293d | 2a28 | 302c | 3229 | 0065 | 6e64 | 3a47 | 2830 |
| 2203740 | 2c31 | 2900 | 6574 | 6578 | 743a | 4728 | 302c | 3129 | 0065 | 6461 | 7461 | 3a47 | 2830 | 2c31 | 2900 | 6f70 | 7461 | 7267 | 3a47 | 2830 | 2c32 | 3029 | 006f | 7074 |
| 2204020 | 696e | 643a | 4728 | 302c | 3129 | 006f | 7074 | 6572 | 723a | 4728 | 302c | 3129 | 0070 | 7472 | 6469 | 6666 | 5f74 | 3a74 | 2830 | 2c31 | 2900 | 7369 | 7a65 | 5f74 |
| 2204100 | 3a74 | 2830 | 2c38 | 2900 | 7374 | 7265 | 616d | 706f | 733a | 7428 | 302c | 3129 | 0073 | 7472 | 6561 | 6d6f | 6666 | 3a74 | 2830 | 2c31 | 2900 | 696f | 5f73 | 7461 |
| 2204160 | 7465 | 3a54 | 2830 | 2c32 | 3129 | 3d65 | 676f | 6f64 | 6269 | 745f | 5f69 | 6f5f | 7374 | 6174 | 653a | 302c | 656f | 6662 | 6974 | 5f5f | 696f | 5f73 | 7461 | 7465 |
| 2204240 | 3a31 | 2c66 | 6169 | 6c62 | 6974 | 5f5f | 696f | 5f73 | 7461 | 7465 | 3a32 | 2c62 | 6164 | 6269 | 745f | 5f69 | 6f5f | 7374 | 6174 | 653a | 332c | 6861 | 7264 | 6661 |
| 2204320 | 696c | 5f5f | 696f | 5f73 | 7461 | 7465 | 3a34 | 2c3b | 006f | 7065 | 6e5f | 6d6f | 6465 | 3a54 | 2830 | 2c32 | 3229 | 3d65 | 696e | 5f5f | 6f70 | 656e | 5f6d | 6f64 |
| 2204400 | 653a | 302c | 6f75 | 745f | 5f6f | 7065 | 6e5f | 6d6f | 6465 | 3a31 | 2c61 | 7465 | 5f5f | 6f70 | 656e | 5f6d | 6f64 | 653a | 322c | 6170 | 705f | 5f6f | 7065 | 6e5f |
| 2204460 | 6d6f | 6465 | 3a33 | 2c74 | 7275 | 6e63 | 5f5f | 6f70 | 656e | 5f6d | 6f64 | 653a | 342c | 6e6f | 6372 | 6561 | 7465 | 5f5f | 6f70 | 656e | 5f6d | 6f64 | 653a | 352c |
| 2204540 | 6e6f | 7265 | 706c | 6163 | 655f | 5f6f | 7065 | 6e5f | 6d6f | 6465 | 3a36 | 2c3b | 0073 | 6565 | 6b5f | 6469 | 723a | 5428 | 302c | 3233 | 293d | 6562 | 6567 | 5f5f |
| 2204620 | 7365 | 656b | 5f64 | 6972 | 3a30 | 2c63 | 7572 | 5f5f | 7365 | 656b | 5f64 | 6972 | 3a31 | 2c65 | 6e64 | 5f5f | 7365 | 656b | 5f64 | 6972 | 3a32 | 2c3b | 005f | 5f45 |
| 2204700 | 313a | 5428 | 302c | 3234 | 293d | 6573 | 6b69 | 7077 | 735f | 5f5f | 5f45 | 313a | 302c | 6c65 | 6674 | 5f5f | 5f5f | 4531 | 3a31 | 2c72 | 6967 | 6874 | 5f5f | 5f5f |
| 2204760 | 4531 | 3a32 | 2c69 | 6e74 | 6572 | 6e61 | 6c5f | 5f5f | 5f45 | 313a | 332c | 6465 | 635f | 5f5f | 5f45 | 313a | 342c | 6f63 | 745f | 5f5f | 5f45 | 313a | 352c | 6865 |
| 2205040 | 785f | 5f5f | 5f45 | 313a | 362c | 7368 | 6f77 | 6261 | 7365 | 5f5f | 5f5f | 4531 | 3a37 | 2c5c | 0073 | 686f | 7770 | 6f69 | 6e74 | 5f5f | 5f5f | 4531 | 3a38 | 2c75 |
| 2205120 | 7070 | 6572 | 6361 | 7365 | 5f5f | 5f5f | 4531 | 3a39 | 2c73 | 696f | 7770 | 6f73 | 5f5f | 5f5f | 4531 | 3a31 | 302c | 7363 | 6965 | 6e74 | 6966 | 6963 | 5f5f | 5f5f |
| 2205200 | 4531 | 3a31 | 312c | 6669 | 7865 | 645f | 5f5f | 5f45 | 313a | 3132 | 2c75 | 6e69 | 7462 | 7566 | 5f5f | 5f5f | 4531 | 3a31 | 332c | 7374 | 6469 | 6f5f | 5f5f | 5f45 |
| 2205260 | 313a | 3134 | 2c3b | 005f | 5f45 | 323a | 5428 | 302c | 3235 | 293d | 6573 | 6b69 | 7070 | 696e | 675f | 5f5f | 5f45 | 323a | 302c | 7469 | 6564 | 5f5f | 5f5f | 4532 |
| 2205340 | 3a31 | 2c3b | 0069 | 6f73 | 3a54 | 2830 | 2c32 | 3629 | 3d73 | 3630 | 6e75 | 7365 | 725f | 5f33 | 696f | 733a | 2830 | 2c31 | 292c | 302c | 3332 | 3b78 | 5f75 | 7365 |
| 2205420 | 725f | 5f33 | 696f | 733a | 2830 | 2c33 | 3029 | 3d2a | 2830 | 2c32 | 3729 | 3d78 | 7569 | 6f73 | 5f75 | 7365 | 725f | 756e | 696f | 6e3a | 2c33 | 322c | 3332 | 3b62 |
| 2205500 | 705f | 5f33 | 696f | 733a | 2830 | 2c33 | 3129 | 3d2a | 2830 | 2c32 | 3929 | 3d78 | 7373 | 7472 | 6561 | 6d62 | 7566 | 3a2c | 3634 | 2c33 | 323b | 7374 | 6174 | 655f |
| 2205560 | 5f33 | 696f | 733a | 2830 | 2c31 | 292c | 3936 | 2c33 | 323b | 6973 | 7065 | 6369 | 616c | 5f5f | 3369 | 6f73 | 3a28 | 302c | 3129 | 2c31 | 3238 | 2c33 | 323b | 6f73 |
| 2205640 | 7065 | 6369 | 616c | 5f5f | 3369 | 6f73 | 3a28 | 302c | 3129 | 2c31 | 3630 | 2c33 | 323b | 6973 | 6678 | 5f73 | 7065 | 6369 | 616c | 5f5f | 3369 | 6f73 | 3a28 | 302c |
| 2205720 | 3129 | 2c31 | 3932 | 2c33 | 323b | 6f73 | 6678 | 5f73 | 7065 | 6369 | 616c | 5f5f | 3369 | 6f73 | 3a28 | 302c | 3129 | 2c32 | 3234 | 2c33 | 323b | 5c00 | 6465 | 6c62 |
| 2206000 | 7566 | 5f5f | 3369 | 6f73 | 3a28 | 302c | 3129 | 2c32 | 3536 | 2c33 | 323b | 785f | 7469 | 655f | 5f33 | 696f | 733a | 2830 | 2c33 | 3229 | 3d2a | 2830 | 2c32 | 3929 |
| 2206060 | 3d78 | 736f | 7374 | 7265 | 616d | 3a2c | 3238 | 382c | 3332 | 3b78 | 5f66 | 6c61 | 6773 | 5f5f | 3369 | 6f73 | 3a28 | 302c | 3129 | 2c33 | 3230 | 2c33 | 323b | 785f |
| 2206140 | 7072 | 6563 | 6973 | 696f | 6e5f | 5f33 | 696f | 733a | 2830 | 2c34 | 292c | 3335 | 322c | 3136 | 3b78 | 5f66 | 696c | 6c5f | 5f33 | 696f | 733a | 2830 | 2c32 | 292c |
| 2206220 | 3336 | 382c | 383b | 785f | 7769 | 6474 | 685f | 5f33 | 696f | 733a | 2830 | 2c34 | 292c | 3338 | 342c | 3136 | 3b61 | 7373 | 6967 | 6e5f | 7072 | 6976 | 6174 | 655f |
| 2206300 | 5f33 | 696f | 733a | 2830 | 2c31 | 292c | 3431 | 362c | 3332 | 3b5f | 5f76 | 7074 | 725f | 5f33 | 696f | 733a | 2830 | 2c33 | 3329 | 342a | 2830 | 2c31 | 3529 | 2c34 |
| 2206360 | 3438 | 2c33 | 323b | 3b00 | 6261 | 7365 | 6669 | 656c | 645f | 5f33 | 696f | 733a | 4728 | 302c | 3129 | 0061 | 646a | 7573 | 7466 | 6965 | 6c64 | 5f5f | 3369 | 6f73 |
| 2206440 | 3a47 | 2830 | 2c31 | 2900 | 666c | 6f61 | 7466 | 6965 | 6c64 | 5f5f | 3369 | 6f73 | 3a47 | 2830 | 2c31 | 2900 | 6e65 | 7874 | 6269 | 745f | 5f33 | 696f | 733a | 4728 |
| 2206520 | 302c | 3129 | 006e | 6578 | 7477 | 6f72 | 645f | 5f33 | 696f | 733a | 4728 | 302c | 3129 | 0073 | 7464 | 696f | 666c | 7573 | 685f | 5f33 | 696f | 733a | 4728 | 302c |
| 2206600 | 3136 | 2900 | 696f | 733a | 5a63 | 696f | 733b | 3b5f | 5f63 | 745f | 5f33 | 696f | 7346 | 5039 | 7374 | 7265 | 616d | 6275 | 6620 | 5f5f | 6374 | 5f5f | 3369 | 6f73 |
| 2206660 | 4676 | 205f | 5f63 | 745f | 5f33 | 696f | 7346 | 5233 | 696f | 7320 | 5f5f | 6474 | 5f5f | 3369 | 6f73 | 4676 | 2066 | 6c61 | 6773 | 5f5f | 3369 | 6f73 | 4676 | 2066 |
| 2206740 | 6c61 | 6773 | 5f5f | 3369 | 6f73 | 466c | 2073 | 6574 | 665f | 5f33 | 696f | 7346 | 6c54 | 3120 | 7365 | 7466 | 5f5f | 3369 | 6f73 | 466c | 2075 | 6e73 | 6574 | 665f |
| 2207020 | 5f33 | 696f | 7346 | 6c20 | 7769 | 6474 | 685f | 5f33 | 696f | 7346 | 7620 | 7769 | 6474 | 685f | 5f33 | 696f | 7346 | 6920 | 7469 | 655f | 5f33 | 696f | 7346 | 5037 |
| 2207100 | 6f73 | 7472 | 6561 | 6d20 | 5c00 | 7469 | 655f | 5f33 | 696f | 7346 | 7620 | 6669 | 6c6c | 5f5f | 3369 | 6f73 | 4663 | 2066 | 696c | 6c5f | 5f33 | 696f | 7346 | 7620 |
| 2207160 | 7072 | 6563 | 6973 | 696f | 6e5f | 5f33 | 696f | 7346 | 6920 | 7072 | 6563 | 6973 | 696f | 6e5f | 5f33 | 696f | 7346 | 7620 | 7264 | 7374 | 6174 | 655f | 5f33 | 696f |
| 2207240 | 7346 | 7620 | 5f5f | 6f70 | 5076 | 5f5f | 3369 | 6f73 | 4676 | 205f | 5f6e | 745f | 5f33 | 696f | 7346 | 7620 | 656f | 665f | 5f33 | 696f | 7346 | 7620 | 6661 | 696c |
| 2207320 | 5f5f | 3369 | 6f73 | 4676 | 2062 | 6164 | 5f5f | 3369 | 6f73 | 4676 | 2067 | 6f6f | 645f | 5f33 | 696f | 7346 | 7620 | 636c | 6561 | 725f | 5f33 | 696f | 7346 | 6920 |
| 2207400 | 7264 | 6275 | 665f | 5f33 | 696f | 7346 | 7620 | 5c00 | 6977 | 6f72 | 645f | 5f33 | 696f | 7346 | 6920 | 7077 | 6f72 | 645f | 5f33 | 696f | 7346 | 6920 | 6269 | 7461 |
| 2207460 | 6c6c | 6f63 | 5f5f | 3369 | 6f73 | 5346 | 7620 | 7861 | 6c6c | 6f63 | 5f5f | 3369 | 6f73 | 5346 | 7620 | 7572 | 6573 | 697a | 655f | 5f33 | 696f | 7346 | 6920 | 7379 |
| 2207540 | 6e63 | 5f77 | 6974 | 685f | 7374 | 6469 | 6f5f | 5f33 | 696f | 7353 | 4676 | 2073 | 6574 | 7374 | 6174 | 655f | 5f33 | 696f | 7346 | 6920 | 696e | 6974 | 5f5f | 3369 |
| 2207620 | 6f73 | 4650 | 3973 | 7472 | 6561 | 6d62 | 7566 | 205f | 5f61 | 735f | 5f33 | 696f | 7346 | 5233 | 696f | 7320 | 736b | 6970 | 5f5f | 3369 | 6f73 | 4669 | 203b | 6261 |
| 2207700 | 7365 | 6669 | 656c | 645f | 5f33 | 696f | 7320 | 5c00 | 6164 | 6a75 | 7374 | 6669 | 656c | 645f | 5f33 | 696f | 7320 | 666c | 6f61 | 7466 | 6965 | 6c64 | 5f5f | 3369 |
| 2207760 | 6f73 | 206e | 6578 | 7462 | 6974 | 5f5f | 3369 | 6f73 | 206e | 6578 | 7477 | 6f72 | 645f | 5f33 | 696f | 7320 | 7374 | 6469 | 6f66 | 6c75 | 7368 | 5f5f | 3369 | 6f73 |

```
2210040 203b 3b00 7374 7265 616d 6275 663a 5428 302c 3238 293d 7334 3061 6c6c 6f63 5f5f 3973 7472 6561 6d62 7566 3a28 302c 3429
2210120 2c30 2c31 363b 785f 756e 6275 665f 5f39 7374 7265 616d 6275 663a 2830 2c34 292c 3136 2c31 363b 785f 6261 7365 5f5f 3973
2210200 7472 6561 6d62 7566 3a28 302c 3230 292c 3332 2c33 323b 785f 7062 6173 655f 5f39 7374 7265 6164 6275 663a 2830 2c32 3029
2210260 2c36 342c 3332 3b78 5f70 7074 725f 5f39 7374 7265 6164 6275 663a 2830 2c32 3029 2c39 362c 3332 3b78 5f65 7070 7472 5f5f
2210340 3973 7472 6561 6d62 7566 3a28 302c 3230 292c 3132 382c 3332 3b78 5f67 7074 725f 5f39 7374 7265 616d 6275 663a 2830 2c32
2210420 3029 2c31 3630 2c33 323b 785f 6567 7074 725f 5f39 7374 7265 616d 6275 663a 2830 2c32 3029 2c31 3932 2c33 323b 5c00 785f
2210500 6562 6163 6b5f 5f39 7374 7265 616d 6275 663a 2830 2c32 3029 2c32 3234 2c33 323b 785f 626c 656e 5f5f 3973 7472 6561 6d62
2210560 7566 3a28 302c 3129 2c32 3536 2c33 323b 5f5f 7670 7472 5f5f 3973 7472 6561 6d62 7566 3a28 302c 3333 292c 3238 382c 3332
2210640 3b3b 0073 7472 6561 6d62 7566 3a5a 6373 7472 6561 6d62 7566 3b3b 5f5f 6374 5f5f 3973 7472 6561 6d62 7566 4652 3973 7472
2210720 6561 6d62 7566 205f 5f63 745f 5f39 7374 7265 616d 6275 6646 7620 5f5f 6374 5f5f 3973 7472 6561 6d62 7566 4650 6369 205f
2211000 5f63 745f 5f39 7374 7265 616d 6275 6646 5063 6954 3220 5f5f 6173 5f5f 3973 7472 6561 6d62 7566 4652 3973 7472 6561 6d62
2211060 7566 2064 6270 5f5f 3973 7472 6561 6d62 7566 4676 2062 6173 655f 5f39 7374 7265 616d 6275 6646 7620 7062 6173 655f 5f39
2211140 7374 7265 616d 6275 6646 7620 5c00 7070 7472 5f5f 3973 7472 6561 6d62 7566 4676 2065 7070 7472 5f5f 3973 7472 6561 6d62
2211220 7566 4676 2067 7074 725f 5f39 7374 7265 616d 6275 6646 7620 6567 7074 725f 5f39 7374 7265 616d 6275 6646 7620 6562 6163
2211300 6b5f 5f39 7374 7265 616d 6275 6646 7620 6562 7566 5f5f 3973 7472 6561 6d62 7566 4676 2062 6c65 6e5f 5f39 7374 7265 616d
2211360 6275 6646 7620 7365 7470 5f5f 3973 7472 6561 6d62 7566 4650 6354 3120 7365 7467 5f5f 3973 7472 6561 6d62 7566 4650 634e
2211440 3231 2070 6275 6d70 5f5f 3973 7472 6561 6d62 7566 4669 205c 0067 6275 6d70 5f5f 3973 7472 6561 6d62 7566 4669 2073 6574
2211520 625f 5f39 7374 7265 616d 6275 6646 5063 5431 6920 756e 6275 6666 6572 6564 5f5f 3973 7472 6561 6d62 7566 4676 2075 6e62
2211600 7566 6665 7265 645f 5f39 7374 7265 616d 6275 6646 6920 616c 6c6f 6361 7465 5f5f 3973 7472 6561 6d62 7566 4676 2064 6f61
2211660 6c6c 6f63 6174 655f 5f39 7374 7265 616d 6275 6646 7620 6f76 6572 666c 6f77 5f5f 3973 7472 6561 6d62 7566 4669 2075 6e64
2211740 6572 666c 6f77 5f5f 3973 7472 6561 6d62 7566 4676 205c 0070 6261 636b 6661 696c 5f5f 3973 7472 6561 6d62 7566 4669 2073
2212020 796e 635f 5f39 7374 7265 616d 6275 6646 7620 7365 656b 6f66 665f 5f39 7374 7265 616d 6275 6646 6c38 7365 656b 5f64 6972
2212100 692c 7365 656b 706f 735f 5f39 7374 7265 616d 6275 6646 6c69 2078 7370 7574 6e5f 5f39 7374 7265 616d 6275 6646 5043 6369
2212160 2078 7367 6574 6e5f 5f39 7374 7265 616d 6275 6646 5063 6920 696e 5f61 7661 696c 5f5f 3973 7472 6561 6d62 7566 4676 206f
2212240 7574 5f77 6169 7469 6e67 5f5f 3973 7472 6561 6d62 7566 4676 205c 0073 6765 7463 5f5f 3973 7472 6561 6d62 7566 4676 2073
2212320 6e65 7874 635f 5f39 7374 7265 616d 6275 6646 7620 7362 756d 7063 5f5f 3973 7472 6561 6d62 7566 4676 2073 746f 7373 635f
2212400 5f39 7374 7265 616d 6275 6646 7620 7370 7574 6261 636b 635f 5f39 7374 7265 616d 6275 6646 6320 7370 7574 635f 5f39 7374
2212460 7265 616d 6275 6646 6920 7370 7574 6e5f 5f39 7374 7265 616d 6275 6646 5043 6369 2073 6765 746e 5f5f 3973 7472 6561 6d62
2212540 7566 4650 6369 2073 6574 6275 665f 5f39 7374 7265 616d 6275 6646 5063 6920 5c00 7365 7462 7566 5f5f 3973 7472 6561 6d62
2212620 7566 4650 5563 6920 7365 7462 7566 5f5f 3973 7472 6561 6d62 7566 4650 6369 5432 205f 5f64 745f 5f39 7374 7265 616d 6275
2212700 6646 7620 785f 736e 6578 7463 5f5f 3973 7472 6561 6d62 7566 4676 203b 3b3b 0069 7374 7265 616d 3a54 2830 2c33 3429 3d73
2212760 3732 785f 6763 6f75 6e74 5f5f 3769 7374 7265 616d 3a28 302c 3129 2c30 2c33 323b 5f5f 7670 7472 5f5f 3769 7374 7265 616d
2213040 3a28 302c 3333 292c 3332 2c33 323b 5069 6f73 3a28 302c 3335 293d 2a28 302c 3236 292c 3634 2c33 323b 4f69 6f73 3a28 302c
2213120 3236 292c 3936 2c34 3830 3b3b 0069 7374 7265 6164 3a5a 6369 7374 7265 616d 3b69 6f73 3b5f 5f63 745f 5f37 6973 7472 6561
2213200 6d46 5039 7374 7265 616d 6275 6620 5f5f 6374 5f5f 3769 7374 7265 616d 4676 205f 5f63 745f 5f37 6973 7472 6561 6d46 5039
2213260 7374 7265 616d 6275 6669 5037 6f73 7472 6561 6d20 5f5f 6374 5f5f 3769 7374 7265 616d 4669 5063 5431 205f 5f63 745f 5f37
2213340 6973 7472 6561 6d46 6954 3150 376f 7374 7265 616d 205f 5f63 745f 5f37 6973 7472 6561 6d46 5237 6973 7472 6561 6d20 5f5f
2213420 6474 5f5f 3769 7374 7265 616d 4676 205c 0069 7066 785f 5f37 6973 7472 6561 6d46 6920 6973 6678 5f5f 3769 7374 7265 616d
2213500 4676 2073 6565 6b67 5f5f 3769 7374 7265 616d 466c 2073 6565 6b67 5f5f 3769 7374 7265 616d 466c 3873 6565 6b5f 6469 7220
2213560 7465 6c6c 675f 5f37 6973 7472 6561 6d46 7620 5f5f 7273 5f5f 3769 7374 7265 616d 4650 4652 3769 7374 7265 616d 5f52 3769
2213640 7374 7265 616d 205f 5f72 735f 5f37 6973 7472 6561 6d46 5046 5233 696f 735f 5233 696f 7320 5f5f 7273 5f5f 3769 7374 7265
2213720 616d 4650 6320 5f5f 7273 5f5f 3769 7374 7265 616d 4650 5563 205c 005f 5f72 735f 5f37 6973 7472 6561 6d46 5255 6320 5f5f
2214000 7273 5f5f 3769 7374 7265 616d 4652 6320 5f5f 7273 5f5f 3769 7374 7265 616d 4652 7320 5f5f 7273 5f5f 3769 7374 7265 616d
2214060 4652 6920 5f5f 7273 5f5f 3769 7374 7265 616d 4652 6c20 5f5f 7273 5f5f 3769 7374 7265 616d 4652 5573 205f 5f72 735f 5f37
2214140 6973 7472 6561 6d46 5255 6920 5f5f 7273 5f5f 3769 7374 7265 616d 4652 556c 205f 5f72 735f 5f37 6973 7472 6561 6d46 5266
2214220 205f 5f72 735f 5f37 6973 7472 6561 6d46 5264 205f 5f72 735f 5f37 6973 7472 6561 6d46 5039 7374 7265 616d 6275 6620 5c00
2214300 6765 745f 5f37 6973 7472 6561 6d46 5063 6963 2067 6574 5f5f 3769 7374 7265 616d 4650 5563 6963 2067 6574 5f5f 3769 7374
2214360 7265 616d 4652 3973 7472 6561 6d62 7566 6320 6765 745f 5f37 6973 7472 6561 6d46 5255 6320 6765 745f 5f37 6973 7472 6561
2214440 6d46 5263 2067 6574 5f5f 3769 7374 7265 616d 4676 2067 6574 6c69 6e65 5f5f 3769 7374 7265 616d 4650 6369 6320 6765 746c
2214520 696e 655f 5f37 6973 7472 6561 6d46 5055 6369 6320 7065 656b 5f5f 3769 7374 7265 616d 4676 2069 676e 6f72 655f 5f37 6973
2214600 7472 6561 6d46 6954 3120 5c00 7265 6164 5f5f 3769 7374 7265 616d 4650 6369 2072 6561 645f 5f37 6973 7472 6561 6d46 5055
2214660 6369 2067 636f 756e 745f 5f37 6973 7472 6561 6d46 7620 7075 7462 6163 6b5f 5f37 6973 7472 6561 6d46 6320 7379 6e63 5f5f
2214740 3769 7374 7265 616d 4676 2064 6f5f 6970 6678 5f5f 3769 7374 7265 616d 4669 2065 6174 7768 6974 655f 5f37 6973 7472 6561
2215020 6d46 7620 7867 6574 5f5f 3769 7374 7265 616d 4650 6320 3b3b 3b00 6f73 7472 6561 6d3a 5428 302c 3239 293d 7336 385f 5f76
2215100 7074 725f 5f37 6f73 7472 6561 6d3a 2830 2c33 3329 2c30 2c33 323b 5069 6f73 3a28 302c 3335 292c 3332 2c33 323b 4f69 6f73
```

```
2215160 3a28 302c 3236 292c 3634 2c34 3830 3b3b 006f 7374 7265 616d 3a5a 636f 7374 7265 616d 3b69 6f73 3b5f 5f63 745f 5f37 6f73
2215240 7472 6561 6d46 5039 7374 7265 616d 6275 6620 5f5f 6374 5f5f 376f 7374 7265 616d 4676 205f 5f63 745f 5f37 6f73 7472 6561
2215320 6d46 6920 5f5f 6374 5f5f 376f 7374 7265 616d 4669 5063 205f 5f63 745f 5f37 6f73 7472 6561 6d46 5237 6f73 7472 6561 6d20
2215400 5f5f 6474 5f5f 376f 7374 7265 616d 4676 206f 7066 785f 5f37 6f73 7472 6561 6d46 7620 6f73 6678 5f5f 376f 7374 7265 616d
2215460 4676 2066 6c75 7368 5f5f 376f 7374 7265 616d 4676 205c 0073 6565 6b70 5f5f 376f 7374 7265 616d 466c 2073 6565 6b70 5f5f
2215540 376f 7374 7265 616d 466c 3873 6565 6b5f 6469 7220 7465 6c6c 705f 5f37 6f73 7472 6561 6d46 7620 7075 745f 5f37 6f73 7472
2215620 6561 6d46 6320 5f5f 6c73 5f5f 376f 7374 7265 616d 4663 205f 5f6c 735f 5f37 6f73 7472 6561 6d46 5563 205f 5f6c 735f 5f37
2215700 6f73 7472 6561 6d46 5043 6320 5f5f 6c73 5f5f 376f 7374 7265 616d 4669 205f 5f6c 735f 5f37 6f73 7472 6561 6d46 6c20 5f5f
2215760 6c73 5f5f 376f 7374 7265 616d 4664 205f 5f6c 735f 5f37 6f73 7472 6561 6d46 6620 5c00 5f5f 6c73 5f5f 376f 7374 7265 616d
2216040 4655 6920 5f5f 6c73 5f5f 376f 7374 7265 616d 4655 6c20 5f5f 6c73 5f5f 376f 7374 7265 616d 4650 7620 5f5f 6c73 5f5f 376f
2216120 7374 7265 616d 4650 3973 7472 6561 6d62 7566 205f 5f6c 735f 5f37 6f73 7472 6561 6d46 7320 5f5f 6c73 5f5f 376f 7374 7265
2216200 616d 4655 7320 5f5f 6c73 5f5f 376f 7374 7265 616d 4650 4652 376f 7374 7265 616d 5f52 376f 7374 7265 616d 205f 5f6c 735f
2216260 5f37 6f73 7472 6561 6d46 5046 5233 696f 735f 5233 695f 7320 7772 6974 655f 5f37 6f73 7472 6561 6d46 5043 6369 205c 0077
2216340 7269 7465 5f5f 376f 7374 7265 616d 4650 4355 6369 2064 6f5f 6f70 6678 5f5f 376f 7374 7265 616d 4676 2064 5f5f 6f73 6678
2216420 5f5f 376f 7374 7265 616d 4676 203b 3b3b 0070 7574 5f5f 376f 7374 7265 616d 4663 3a66 2830 2c33 3629 3d2a 2830 2c32 3929
2216500 005f 5f30 7468 6973 3a70 2830 2c33 3629 005f 5f30 633a 7028 302c 3229 002f 7573 722f 4343 2f73 756e 342f 696e 636c 2f69
2216560 6f73 7472 6561 632e 6800 5f5f 3074 6869 733a 7228 302c 3336 2900 5f5f 3074 6869 7320 3a5a 746c 005f 5f30 6320 3a5a 746c
2216640 0070 7574 5f5f 376f 7374 7265 616d 4663 203a 5a74 4600 696f 7374 7265 616d 3a54 2830 2c33 3729 3473 3930 785f 6763 6f75
2216720 6e74 5f5f 3769 7374 7265 616d 3a28 302c 3129 2c30 2c33 323b 5f5f 7670 7472 5f5f 3769 7374 7265 616d 3a28 302c 3333 292c
2217000 3332 2c33 323b 5069 6f73 3a28 302c 3335 292c 3634 2c33 323b 4f6f 7374 7265 616d 3a28 302c 3239 292c 3936 2c35 3434 3b3b
2217060 0069 6f73 7472 6561 6d3a 5a63 696f 7374 7265 616d 3b69 7374 7265 616d 206f 7374 7265 616d 2069 6f73 3b5f 5f63 745f 5f38
2217140 696f 7374 7265 616d 4650 3973 7472 6561 6d62 7566 205f 5f63 745f 5f38 696f 7374 7265 616d 4676 205f 5f63 745f 5f38 696f
2217220 7374 7265 616d 4652 3869 6f73 7472 6561 6120 5f5f 6474 5f5f 3869 6f73 7472 6561 6d46 7620 3b3b 3b00 6369 6e3a 4728 302c
2217300 3338 293d 7873 6973 7472 6561 645f 7769 7468 6173 7369 676e 3a00 636f 7574 3a47 2830 2c33 3929 3d78 736f 7374 7265 616d
2217360 5f77 6974 6861 7373 6967 6e3a 0063 6572 723a 4728 302c 3339 2900 636c 6f67 3a47 2830 2c33 3929 0049 6f73 7472 6561 6d5f
2217440 696e 6974 3a54 2930 2c34 3029 3473 315f 5f57 395f 5f31 3349 6f73 7472 6561 6d5f 696e 6974 3a28 302c 3229 2c30 2c38 3b3b
2217520 0073 7464 7374 6174 7573 5f5f 3133 496f 7374 7265 616d 5f69 6e69 743a 4728 302c 3129 0069 6e69 7463 6f75 6e74 5f5f 3133
2217600 496f 7374 7265 616d 5f69 6e69 743a 4728 302c 3129 0049 6f73 7472 6561 6d5f 696e 6974 3a5a 6349 6f73 7472 6561 6d5f 696e
2217660 6974 3b3b 5f5f 6374 5f5f 3133 496f 7374 7265 616d 5f69 6e69 7446 7620 5f5f 6474 5f5f 3133 496f 7374 7265 616d 5f69 6e69
2217740 7446 7620 3b73 7464 7374 6174 7573 5f5f 3133 496f 7374 7265 616d 5f69 6e69 7420 696e 6974 636f 756e 745f 5f31 3349 6f73
2220020 7472 6561 6d5f 696e 6974 203b 4969 6f73 3b00 696f 7374 7265 616d 5f69 6e69 743a 5328 302c 3430 2900 4750 543a 7428 302c
2220100 3133 2900 736d 616e 6970 5f69 6e74 3a54 2830 2c34 3129 3d73 3866 6374 5f5f 3130 736d 616e 6970 5f69 6e74 3a28 302c 3432
2220160 293d 2a28 302c 3433 293d 6628 302c 3335 292c 302c 3332 3b61 7267 5f5f 3130 736d 616e 6970 5f69 6e74 3a28 302c 3129 2c33
2220240 322c 3332 3b3b 0073 6d61 6e69 705f 696e 743a 5a63 736d 616e 6970 5f69 6e74 3b3b 5f5f 6374 5f5f 3130 736d 616e 6970 5f69
2220320 6e74 4650 4652 3369 6f73 695f 5233 696f 7369 203b 3b5f 5f6c 735f 5f46 5237 6f73 7472 6561 6d52 3130 736d 616e 6970 5f69
2220400 6e74 205f 5f72 735f 5f46 5237 6973 7472 6561 6d52 3130 736d 616e 6970 5f69 6e74 203b 0073 6170 706c 795f 696e 743a 5428
2220460 302c 3434 293d 7334 6663 745f 5f31 3073 6170 706c 795f 696e 743a 2830 2c34 3229 2c30 2c33 323b 3b00 7361 7070 6c79 5f69
2220540 6e74 3a5a 6373 6170 706c 795f 696e 743b 3b5f 5f63 745f 5f31 3073 6170 706c 795f 696e 7446 5046 5233 696f 7369 5f52 3369
2220620 6f73 205f 5f63 6c5f 5f31 3073 6170 706c 795f 696e 7446 6920 3b3b 3b00 696d 616e 6970 5f69 6e74 3a54 2830 2c34 3529 3d73
2220700 3866 6374 5f5f 3130 696d 616e 6970 5f69 6e74 3a28 302c 3436 293d 2a28 302c 3437 293d 6628 302c 3438 293d 2a28 302c 3334
2220760 292c 302c 3332 3b61 7267 5f5f 3130 696d 616e 6970 5f69 6e74 3a28 302c 3129 2c33 322c 3332 3b3b 0069 6d61 6e69 705f 696e
2221040 743a 5a63 696d 616e 6970 5f69 6e74 3b3b 5f5f 6374 5f5f 3130 696d 616e 6970 5f69 6e74 4650 4652 3769 7374 7265 616d 695f
2221120 5237 6973 7472 6561 6d69 203b 3b5f 5f72 735f 5f46 5237 6973 7472 6561 6d52 3130 696d 616e 6970 5f69 6e74 203b 0069 6170
2221200 706c 795f 696e 743a 5428 302c 3439 293d 7334 6663 745f 5f31 3069 6170 706c 795f 696e 743a 2830 2c34 3629 2c30 2c33 323b
2221260 3b00 6961 7070 6c79 5f69 6e74 3a5a 6369 6170 706c 795f 696e 743b 3b5f 5f63 745f 5f31 3069 6170 706c 795f 696e 7446 5046
2221340 5237 6973 7472 6561 6d69 5f52 3769 7374 7265 616d 205f 5f63 6c5f 5f31 3069 6170 706c 795f 696e 7446 6920 3b3b 3b00 6f6d
2221420 616e 6970 5f69 6e74 3a54 2830 2c35 3029 3473 3966 6374 5f5f 3130 6f6d 616e 6970 5f69 6e74 3a28 302c 3531 293d 2a28 302c
2221500 3532 293d 6628 302c 3336 292c 302c 3332 3b61 7267 5f5f 3130 6f6d 616e 6970 5f69 6e74 3a28 302c 3129 2c33 322c 3332 3b3b
2221560 006f 6d61 6e69 705f 696e 743a 5a63 6f6d 616e 6970 5f69 6e74 3b3b 5f5f 6374 5f5f 3130 6f6d 616e 6970 5f69 6e74 4650 4652
2221640 376f 7374 7265 616d 695f 5237 6f73 7472 6561 6d69 203b 3b5f 5f6c 735f 5f46 5237 6f73 7472 6561 6d52 3130 6f6d 616e 6970
2221720 5f69 6e74 203b 006f 6170 706c 795f 696e 743a 5428 302c 3533 293d 7334 6663 745f 5f31 306f 6170 706c 795f 696e 743a 2830
2222000 2c35 3129 2c30 2c33 323b 3b00 6f61 7070 6c79 5f69 6e74 3a5a 636f 6170 706c 795f 696e 743b 3b5f 5f63 745f 5f31 306f 6170
2222060 706c 795f 696e 7446 5046 5237 6f73 7472 6561 6d69 5f52 376f 7374 7265 616d 205f 5f63 6c5f 5f31 306f 6170 706c 795f 696e
2222140 7446 6920 3b3b 3b00 696f 6d61 6e69 705f 696e 743a 5428 302c 3534 293d 7338 6663 745f 5f31 3169 6f6d 616e 6970 5f69 6e74
2222220 3a28 302c 3535 293d 2a28 302c 3536 293d 6628 302c 3537 293d 2a28 302c 3337 292c 302c 3332 3b61 7267 5f5f 3131 696f 6d61
```

```
2222300 6e69 705f 696e 743a 2830 2c31 292c 3332 2c33 323b 3b00 696f 6d61 6e69 705f 696e 743a 5a63 696f 6d61 6e69 705f 696e 743b
2222360 3b5f 5f63 745f 5f31 3169 6f6d 616e 6970 5f69 6e74 4650 4652 3869 6f73 7472 6561 6d69 5f52 3869 6f73 7472 6561 6d69 203b
2222440 3b5f 5f6c 735f 5f46 5238 696f 7374 7265 616d 5231 3169 6f61 616e 6970 5f69 6e74 205f 5f72 735f 5f46 5238 696f 7374 7265
2222520 616d 5231 3169 6f6d 616e 6970 5f69 6e74 203b 0069 6f61 7070 6c79 5f69 6e74 3a54 2830 2c35 3829 3d73 3466 6374 5f5f 3131
2222600 696f 6170 706c 795f 696e 743a 2830 2c35 3529 2c30 2c33 323b 3b00 696f 6170 706c 795f 696e 743a 5a63 696f 6170 706c 795f
2222660 696e 743b 3b5f 5f63 745f 5f31 3169 6f61 7070 6c79 5f69 6e74 4650 4652 3869 6f73 7472 6561 6d69 5f52 3869 6f73 7472 6561
2222740 6d20 5f5f 636c 5f5f 3131 696f 6170 706c 795f 696e 7446 6920 3b3b 3b00 736d 616e 6970 5f6c 6f6e 673a 5428 302c 3539 293d
2223020 7338 6663 745f 5f31 3173 6d61 6e69 705f 6c6f 6e67 3a28 302c 3432 292c 302c 3332 3b61 7267 5f5f 3131 736d 616e 6970 5f6c
2223100 6f6e 673a 2830 2c31 292c 3332 2c33 323b 3b00 736d 616e 6970 5f6c 6f6e 673a 5a63 736d 616e 6970 5f6c 6f6e 673b 3b5f 5f63
2223160 745f 5f31 3173 6d61 6e69 705f 6c6f 6e67 4650 4652 3369 6f73 6c5f 5233 696f 736c 203b 3b5f 5f6c 735f 5f46 5237 6f73 7472
2223240 6561 6d52 3131 736d 616e 6970 5f6c 6f6e 6720 5f5f 7273 5f5f 4652 3769 7374 7265 616d 5231 3173 6d61 6e69 705f 6c6f 6e67
2223320 203b 0073 6170 706c 795f 6c6f 6e67 3a54 2830 2c36 3029 3d73 3466 6374 5f5f 3131 7361 7070 6c79 5f6c 6f6e 673a 2830 2c34
2223400 3229 2c30 2c33 323b 3b00 7361 7070 6c79 5f6c 6f6e 673a 5a63 7361 7070 6c79 5f6c 6f6e 673b 3b5f 5f63 745f 5f31 3173 6170
2223460 706c 795f 6c6f 6e67 4650 4652 3369 6f73 6c5f 5233 696f 7320 5f5f 636c 5f5f 3131 7361 7070 6c79 5f6c 6f6e 6746 6c20 3b3b
2223540 3b00 696d 616e 6970 5f6c 6f6e 673a 5428 302c 3631 293d 7338 6663 745f 5f31 3169 6d61 6e69 705f 6c6f 6e67 3a28 302c 3436
2223620 292c 302c 3332 3b61 7267 5f5f 3131 696d 616e 6970 5f6c 6f6e 673a 2830 2c31 292c 3332 2c33 323b 3b00 696d 616e 6970 5f6c
2223700 6f6e 673a 5a63 696d 616e 6970 5f6c 6f6e 673b 3b5f 5f63 745f 5f31 3169 6d61 6e69 705f 6c6f 6e67 4650 4652 3769 7374 7265
2223760 616d 6c5f 5237 6973 7472 6561 6d6c 203b 3b5f 5f72 735f 5f46 5237 6973 7472 6561 6d52 3131 696d 616e 6970 5f6c 6f6e 6720
2224040 3b00 6961 7070 6c79 5f6c 6f6e 673a 5428 302c 3632 293d 7334 6663 745f 5f31 3169 6170 706c 795f 6c6f 6e67 3a28 302c 3436
2224120 292c 302c 3332 3b3b 0069 6170 706c 795f 6c6f 6e67 3a5a 6369 6170 706c 795f 6c6f 6e67 3b3b 5f5f 6374 5f5f 3131 6961 7070
2224200 6c79 5f6c 6f6e 6746 5046 5237 6973 7472 6561 6d6c 5f52 3769 7374 7265 616d 205f 5f63 6c5f 5f31 3169 6170 706c 795f 6c6f
2224260 6e67 466c 203b 3b3b 006f 6d61 6e69 705f 6c6f 6e67 3a54 2830 2c36 3329 3d73 3866 6374 5f5f 3131 6f6d 616e 6970 5f6c 6f6e
2224340 673a 2830 2c35 3129 2c30 2c33 323b 6172 675f 5f31 316f 6d61 6e69 705f 6c6f 6e67 3a28 302c 3129 2c33 322c 3332 3b3b 006f
2224420 6d61 6e69 705f 6c6f 6e67 3a5a 636f 6d61 6e69 705f 6c6f 6e67 3b3b 5f5f 6374 5f5f 3131 6f6d 616e 6970 5f6c 6f6e 6746 5046
2224500 5237 6f73 7472 6561 6d6c 5f52 376f 7374 7265 616d 6c20 3b3b 5f5f 6c73 5f5f 4652 376f 7374 7265 616d 5231 316f 6d61 6e69
2224560 705f 6c6f 6e67 203b 006f 6170 706c 795f 6c6f 6e67 3a54 2830 2c36 3429 3d73 3466 6374 5f5f 3131 6f61 7070 6c79 5f6c 6f6e
2224640 673a 2830 2c35 3129 2c30 2c33 323b 3b00 6f61 7070 6c79 5f6c 6f6e 673a 5a63 6f61 7070 6c79 5f6c 6f6e 673b 3b5f 5f63 745f
2224720 5f31 316f 6170 706c 795f 6c6f 6e67 4650 4652 376f 7374 7265 616d 6c5f 5237 6f73 7472 6561 6d20 5f5f 636c 5f5f 3131 6f61
2225000 7070 6c79 5f6c 6f6e 6746 6c20 3b3b 3b00 696f 6d61 6e69 705f 6c6f 6e67 3a54 2830 2c36 3529 3d73 3966 6374 5f5f 3132 696f
2225060 6d61 6e69 705f 6c6f 6e67 3a28 302c 3535 292c 302c 3332 3b61 7267 5f5f 3132 696f 6d61 6e69 705f 6c6f 6e67 3a28 302c 3129
2225140 2c33 322c 3332 3b3b 0069 6f6d 616e 6970 5f6c 6f6e 673a 5a63 696f 6d61 6e69 705f 6c6f 6e67 3b3b 5f5f 6374 5f5f 3132 696f
2225220 6d61 6e69 705f 6c6f 6e67 4650 4652 3869 6f73 7472 6561 6d6c 5f52 3869 6f73 7472 6561 6d6c 203b 3b5f 5f6c 735f 5f46 5238
2225300 696f 7374 7265 616d 5231 3269 6f6d 616e 6970 5f6c 6f6e 6720 5f5f 7273 5f5f 4652 3869 6f73 7472 6561 6d52 3132 696f 6d61
2225360 6e69 705f 6c6f 6e67 203b 0069 6f61 7070 6c79 5f6c 6f6e 673a 5428 302c 3636 293d 7334 6663 745f 5f31 3269 6f61 7070 6c79
2225440 5f6c 6f6e 673a 2830 2c35 3529 2c30 2c33 323b 3b00 696f 6170 706c 795f 6c6f 6e67 3a5a 6369 6f61 7070 6c79 5f6c 6f6e 673b
2225520 3b5f 5f63 745f 5f31 3269 6f61 7070 6c79 5f6c 6f6e 6746 5046 5238 696f 7374 7265 616d 6c5f 5238 696f 7374 7265 616d 205f
2225600 5f63 6c5f 5f31 3269 6f61 7070 6c79 5f6c 6f6e 6746 6c20 3b3b 3b00 7374 6469 6f62 7566 3a54 2830 2c36 3729 3d73 3532 616c
2225660 6c6f 635f 5f39 7374 7265 616d 6275 663a 2830 2c34 292c 302c 3136 3b78 5f75 6e62 7566 5f5f 3973 7472 6561 6d62 7566 3a28
2225740 302c 3429 2c31 362c 3136 3b78 5f62 6173 655f 5f39 7374 7265 616d 6275 663a 2830 2c32 3029 2c33 322c 3332 3b78 5f70 6261
2226020 7365 5f5f 3973 7472 6561 6d62 7566 3a28 302c 3230 292c 3634 2c33 323b 785f 7070 7472 5f5f 3973 7472 6561 6d62 7566 3a28
2226100 302c 3230 292c 3936 2c33 323b 785f 6570 7074 725f 5f39 7374 7265 6161 6275 663a 2830 2c32 3029 2c31 3238 2c33 323b 785f
2226160 6770 7472 5f5f 3973 7472 6561 6162 7566 3a28 302c 3230 292c 3136 302c 3332 3b78 5f65 6770 7472 5f5f 3973 7472 6561 6d62
2226240 7566 3a28 302c 3230 292c 3139 322c 3332 3b5c 0078 5f65 6261 636b 5f5f 3973 7472 6561 6d62 7566 3a28 302c 3230 292c 3232
2226320 342c 3332 3b78 5f62 6c65 6e5f 5f39 7374 7265 616d 6275 663a 2830 2c31 292c 3235 362c 3332 3b5f 5f76 7074 725f 5f39 7374
2226400 7265 616d 6275 663a 2830 2c33 3329 2c32 3839 2c33 323b 6670 5f5f 3873 7464 696f 6275 663a 2830 2c36 3829 3d2a 2830 2c31
2226460 3829 3478 735f 696f 6275 663a 2c33 3230 2c33 323b 6c61 7374 5f6f 705f 5f38 7374 6469 6f62 7566 3a28 302c 3129 2c33 3532
2226540 2c33 323b 6275 665f 5f38 7374 6469 6f62 7566 3a28 302c 3639 293d 6172 2830 2c31 293b 303b 313b 2830 2c32 292c 3338 342c
2226620 3136 3b3b 0073 7464 696f 6275 663a 5a63 7374 6469 6f62 7566 3b73 7472 6561 6d62 7566 3b6f 7665 7266 6c6f 775f 5f38 7374
2226700 6469 6f62 7566 4669 2075 6e64 6572 666c 6f77 5f5f 3873 7464 696f 6275 6646 7620 7379 6e63 5f5f 3873 7464 696f 6275 6646
2226760 7620 7365 656b 6f66 665f 5f38 7374 6469 6f62 7566 466c 3873 6565 6b5f 6469 7269 2070 6261 636b 6661 696c 5f5f 3873 7464
2227040 696f 6275 6646 6920 5f5f 6374 5f5f 3873 7464 696f 6275 6646 5036 5f69 6f62 7566 205f 5f63 745f 5f38 7374 6469 6f62 7566
2227120 4652 4338 7374 6469 6f62 7566 205c 0073 7464 696f 6669 6c65 5f5f 3873 7464 696f 6275 6646 7620 5f5f 6474 5f5f 3873 7464
2227200 696f 6275 6646 7620 3b3b 3b00 6669 6c65 6275 663a 5428 302c 3730 293d 7336 3461 6c6c 6f63 5f5f 3973 7472 6561 6d62 7566
2227260 3a28 302c 3429 2c30 2c31 363b 785f 756e 6275 665f 5f39 7374 7265 616d 6275 663a 2830 2c34 292c 3136 2c31 363b 785f 6261
2227340 7365 5f5f 3973 7472 6561 6d62 7566 3a28 302c 3230 292c 3332 2c33 323b 785f 7062 6173 655f 5f39 7374 7265 616d 6275 663a
```

```
2227420 2830 2c32 3029 2c36 342c 3332 3b78 5f70 7074 725f 5f39 7374 7265 616d 6275 663a 2830 2c32 3029 2c39 362c 3332 3b78 5f65
2227500 7070 7472 5f5f 3973 7472 6561 6d62 7566 3a28 302c 3230 292c 3132 382c 3332 3b78 5f67 7074 725f 5f39 7374 7265 616d 6275
2227560 663a 2830 2c32 3029 2c31 3639 2c33 323b 785f 6567 7074 725f 5f39 7374 7265 616d 6275 663a 2830 2c32 3029 2c31 3932 2c33
2227640 323b 5c00 785f 6562 6163 6b5f 5f39 7374 7265 616d 6275 663a 2830 2c32 3029 2c32 3234 2c33 323b 785f 626c 656e 5f5f 3973
2227720 7472 6561 6d62 7566 3a28 302c 3129 2c32 3536 2c33 323b 5f5f 7670 7472 5f5f 3973 7472 6561 6d62 7566 3a28 302c 3333 292c
2230000 3238 382c 3332 3b78 6664 5f5f 3766 696c 6562 7566 3a28 302c 3129 2c33 3230 2c33 323b 6d6f 6465 5f5f 3766 696c 6562 7566
2230060 3a28 302c 3129 2c33 3532 2c33 323b 6f70 656e 6564 5f5f 3766 696c 6562 7566 3a28 302c 3229 2c33 3834 2c38 3b6c 6173 745f
2230140 7365 656b 5f5f 3766 696c 6562 7566 3a28 302c 3129 2c34 3136 2c33 323b 696e 5f73 7461 7274 5f5f 3766 696c 6562 7566 3a28
2230220 302c 3230 292c 3434 382c 3332 3b6c 6168 6561 645f 5f37 6669 6c65 6275 663a 2830 2c36 3929 2c34 3830 2c31 363b 3b00 6f70
2230300 656e 7072 6f74 5f5f 3766 696c 6562 7566 3a47 2830 2c31 2900 6669 6c65 6275 663a 5a63 6669 6c65 6275 663b 7374 7265 616d
2230360 6275 663b 5f5f 6374 5f5f 3766 696c 6562 7566 4676 205f 5f63 745f 5f37 6669 6c65 6275 6646 6920 5f5f 6374 5f5f 3766 696c
2230440 6562 7566 4669 5063 5431 205f 5f63 745f 5f37 6669 6c65 6275 6646 5243 3766 696c 6562 7566 2069 735f 6f70 656e 5f5f 3766
2230520 696c 6562 7566 4676 2066 645f 5f37 6669 6c65 6275 6646 7620 6f70 656e 5f5f 3766 696c 6562 7566 4650 4363 6954 3220 6174
2230600 7461 6368 5f5f 3766 696c 6562 7566 4669 2063 6c6f 7365 5f5f 3766 696c 6562 7566 4676 205c 005f 5f64 745f 5f37 6669 6c65
2230660 6275 6646 7620 6f76 6572 666c 6f77 5f5f 3766 696c 6562 7566 4669 2075 6e64 6572 666c 6f77 5f5f 3766 696c 6562 7566 4676
2230740 2073 796e 635f 5f37 6669 6c65 6275 6646 7620 7365 656b 6f66 665f 5f37 6669 6c65 6275 6646 6c38 7365 656b 5f64 6972 6920
2231020 7365 7462 7566 5f5f 3766 696c 6562 7566 4650 6369 206c 6173 745f 6f70 5f5f 3766 696c 6562 7566 4676 203b 6f70 656e 7072
2231100 6f74 5f5f 3766 696c 6562 7566 203b 3b00 6673 7472 6561 6d62 6173 653a 5428 302c 3731 293d 7331 3332 6275 665f 5f31 3166
2231160 7374 7265 616d 6261 7365 3a28 302c 3730 292c 302c 3531 323b 5f5f 7670 7472 5f5f 3131 6673 7472 6561 6d62 6173 653a 2830
2231240 2c33 3329 2c35 3132 2c33 323b 5069 6f73 3a28 302c 3335 292c 3534 342c 3332 3b4f 696f 733a 2830 2c32 3629 2c35 3736 2c34
2231320 3830 3b3b 0066 7374 7265 616d 6261 7365 3a5a 6366 7374 7265 616d 6261 7365 3b69 6f73 3b5f 5f63 745f 5f31 3166 7374 7265
2231400 616d 6261 7365 4676 205f 5f63 745f 5f31 3166 7374 7265 616d 6261 7365 4650 4363 6954 3220 5f5f 6374 5f5f 3131 6673 7472
2231460 6561 6d62 6173 6546 6920 5f5f 6374 5f5f 3131 6673 7472 6561 6d62 6173 6546 6950 6354 3120 5f5f 6374 5f5f 3131 6673 7472
2231540 6561 6d62 6173 6546 5231 3166 7374 7265 616d 6261 7365 205f 5f64 745f 5f31 3166 7374 7265 616d 6261 7365 4676 206f 7065
2231620 6e5f 5f31 3166 7374 7265 616d 6261 7365 4650 4363 6954 3220 5c00 6174 7461 6368 5f5f 3131 6673 7472 6561 6d62 6173 6546
2231700 6920 636c 6f73 655f 5f31 3166 7374 7265 616d 6261 7365 4676 2073 6574 6275 665f 5f31 3166 7374 7265 616d 6261 7365 4650
2231760 6369 2072 6462 7566 5f5f 3131 6673 7472 6561 6d62 6173 6546 7620 7665 7269 6679 5f5f 3131 6673 7472 6561 6d62 6173 6546
2232040 6920 3b3b 3b00 7374 6174 655f 7661 6c75 653a 7428 302c 3231 2900 5661 6c75 655f 5479 7065 3a54 2830 2c37 3229 3d65 554e
2232120 4b4e 4f57 4e56 3a30 2c53 5452 494e 473a 312c 494e 5445 4745 523a 322c 464c 4f41 543a 332c 3b00 426c 6f63 6b5f 5479 7065
2232200 3a54 2830 2c37 3329 3d65 554e 4b4e 4f57 4e42 3a30 2c45 4e54 4954 593a 312c 4655 4e43 5449 4f4e 3a32 2c50 524f 4345 4455
2232260 5245 3a33 2c3b 0045 6e74 6974 795f 5479 7065 3a54 2830 2c37 3429 3d65 554e 4b4e 4f57 4e45 3a30 2c41 5243 4849 5445 4354
2232340 5552 453a 312c 5355 4250 524f 4752 414d 3a32 2c3b 0050 696e 5f54 7970 653a 5428 302c 3735 293d 6555 4e4b 4e4f 574e 503a
2232420 302c 494e 5049 4e3a 312c 4f55 5450 494e 3a32 2c49 4e4f 5554 5049 4e3a 332c 3b00 5061 7261 5f43 6c61 7373 3a54 2830 2c37
2232500 3629 3d65 554e 4b4e 4f57 4e43 3a30 2c46 4f52 4d41 4c3a 312c 4143 5455 414c 3a32 2c52 4553 4f4c 5645 443a 332c 3b00 424f
2232560 4f4c 4541 4e3a 5428 302c 3737 293d 6546 616c 7365 3a30 2c54 7275 653a 312c 3b00 426f 6f6c 6561 6e3a 5428 302c 3738 293d
2232640 6566 616c 7365 3a30 2c74 7275 653a 312c 3b00 4275 6666 6572 3a47 2830 2c32 3029 004f 626a 6563 743a 5428 302c 3739 293d
2232720 7334 5f5f 7670 7472 5f5f 364f 626a 6563 743a 2830 2c33 3329 2c30 2c33 323b 3b00 4f62 6a65 6374 3a5a 634f 626a 6563 743b
2233000 3b5f 5f63 745f 5f36 4f62 6a65 6374 4676 205f 5f63 745f 5f36 4f62 6a65 6374 4652 4336 4f62 6a65 6374 2065 7272 6f72 4d65
2233060 6d6f 7279 5f5f 364f 626a 6563 7446 5063 5431 2065 7870 6c61 696e 5f5f 364f 626a 6563 7446 5063 2069 6e4f 7264 6572 5f5f
2233140 364f 626a 6563 7446 5036 4f62 6a65 6374 203b 3b3b 005f 5f70 7462 6c5f 5f36 4f62 6a65 6374 5f5f 7061 7261 6d65 7465 725f
2233220 6378 783a 4728 332c 3333 2900 5046 3a74 2830 2c31 3529 0050 4643 3a74 2830 2c31 3529 0050 4649 3a74 2830 2c31 3529 004e
2233300 4f62 6a65 6374 3a54 2830 2c38 3029 3d73 385f 5f76 7074 725f 5f36 4f62 6a65 6374 3a28 302c 3333 292c 302c 3332 3b6e 616d
2233360 655f 5f37 4e4f 626a 6563 743a 2830 2c32 3029 2c33 322c 3332 3b3b 004e 4f62 6a65 6374 3a5a 634e 4f62 6a65 6374 3b4f 626a
2233440 6563 743b 5f5f 6374 5f5f 374e 4f62 6a65 6374 4650 6320 5f5f 6374 5f5f 374e 4f62 6a65 6374 4652 4337 4e4f 626a 6563 7420
2233520 7365 744e 616d 655f 5f37 4e4f 626a 6563 7446 5063 2067 6574 4e61 6d65 5f5f 374e 4f62 6a65 6374 4676 2065 7870 6c61 696e
2233600 5f5f 374e 4f62 6a65 6374 4650 6320 6765 7441 7474 725f 5f37 4e4f 626a 6563 7446 6920 6765 7450 726f 705f 5f37 4e4f 626a
2233660 6563 7446 5063 6920 7365 7450 726f 705f 5f37 4e4f 626a 6563 7446 5063 5431 205c 0073 6574 5072 6f70 5f5f 374e 4f62 6a65
2233740 6374 4650 6369 2073 6574 5072 6f70 5f5f 374e 4f62 6a65 6374 4650 6366 2069 7347 5445 5f5f 374e 4f62 6a65 6374 4650 364f
2234020 626a 6563 7420 6973 4c54 455f 5f37 4e4f 626a 6563 7446 5036 4f62 6a65 6374 203b 3b3b 006f 7374 7265 616d 5f77 6974 6861
2234100 7373 6967 6e3a 5428 302c 3339 293d 7336 385f 5f76 7074 725f 5f37 6f73 7472 6561 6d3a 2830 2c33 3329 2c30 2c33 323b 5069
2234160 6f73 3a28 302c 3335 292c 3332 2c33 323b 4f69 6f73 3a28 302c 3236 292c 3634 2c34 3830 3b3b 006f 7374 7265 616d 5f77 6974
2234240 6861 7373 6967 6e3a 5a63 6f73 7472 6561 6d5f 7769 7468 6173 7369 676e 3b6f 7374 7265 616d 2069 6f73 3b5f 5f63 745f 5f31
2234320 386f 7374 7265 616d 5f77 6974 6861 7373 6967 6e46 7620 5f5f 6374 5f5f 3138 6f73 7472 6561 6d5f 7769 7468 6173 7369 676e
2234400 4652 3138 6f73 7472 6561 6d5f 7769 7468 6173 7369 676e 205f 5f64 745f 5f31 386f 7374 7265 616d 5f77 6974 6861 7373 6967
2234460 6e46 7620 5f5f 6173 5f5f 3138 6f73 7472 6561 6d5f 7769 7468 6173 7369 676e 4652 376f 7374 7265 616d 205c 005f 5f61 735f
```

```
2234540 5f31 386f 7374 7265 616d 5f77 6974 6861 7373 6967 6e46 5039 7374 7265 616d 6275 6620 3b3b 3b00 5046 423a 7428 302c 3135
2234620 2900 4c4e 4f62 6a65 6374 3a54 2830 2c38 3129 3d73 3132 5f5f 7670 7472 5f5f 364f 626a 6563 743a 2830 2c33 3329 2c30 2c33
2234700 323b 6e61 6d65 5f5f 374e 4f62 6a65 6374 3a28 302c 3230 292c 3332 2c33 323b 6e65 7874 5f5f 384c 4e4f 626a 6563 743a 2830
2234760 2c38 3229 3d2a 2830 2c38 3129 2c36 342c 3332 3b3b 004c 4e4f 626a 6563 743a 5a63 4c4e 4f62 6a65 6374 3b4e 4f62 6a65 6374
2235040 3b5f 5f63 745f 5f38 4c4e 4f62 6a65 6374 4650 6350 384c 4e4f 626a 6563 7420 5f5f 6374 5f5f 384c 4e4f 626a 6563 7446 5243
2235120 384c 4e4f 626a 6563 7420 7365 744e 6578 745f 5f38 4c4e 4f62 6a65 6374 4650 384c 4e4f 626a 6563 7420 6765 744e 6578 745f
2235200 5f38 4c4e 4f62 6a65 6374 4676 203b 3b3b 004c 4f62 6a65 6374 3a54 2830 2c38 3329 3d73 385f 5f76 7074 725f 5f36 4f62 6a65
2235260 6374 3a28 302c 3333 292c 302c 3332 3b6e 6578 745f 5f37 4c4f 626a 6563 743a 2830 2c38 3429 3d2a 2830 2c38 3329 2c33 322c
2235340 3332 3b3b 004c 4f62 6a65 6374 3a5a 634c 4f62 6a65 6374 3b4f 626a 6563 743b 5f5f 6374 5f5f 374c 4f62 6a65 6374 4650 374c
2235420 4f62 6a65 6374 205f 5f63 745f 5f37 4c4f 626a 6563 7446 5243 374c 4f62 6a65 6374 2073 6574 4e65 7874 5f5f 374c 4f62 6a65
2235500 6374 4650 374c 4f62 6a65 6374 2067 6574 4e65 7874 5f5f 374c 4f62 6a65 6374 4676 203b 3b3b 004c 504f 626a 6563 743a 5428
2235560 302c 3935 293d 7331 325f 5f76 7074 725f 5f36 4f62 6a65 6374 3a28 302c 3333 292c 302c 3332 3b6e 6578 745f 5f37 4c4f 626a
2235640 6563 743a 2830 2c38 3429 2c33 322c 3332 3b6e 6f62 6a70 7472 5f5f 384c 504f 626a 6563 743a 2830 2c38 3629 3d2a 2830 2c38
2235720 3029 2c36 342c 3332 3b3b 004c 504f 626a 6563 743a 5a63 4c50 4f62 6a65 6374 3b4c 4f62 6a65 6374 3b5f 5f63 745f 5f38 4c50
2236000 4f62 6a65 6374 4650 374e 4f62 6a65 6374 5037 4c4f 626a 6563 7420 5f5f 6374 5f5f 384c 504f 626a 6563 7446 5243 384c 504f
2236060 626a 6563 7420 7365 744f 626a 6563 745f 5f38 4c50 4f62 6a65 6374 4650 374e 4f62 6a65 6374 2067 6574 4f62 6a65 6374 5f5f
2236140 384c 504f 626a 6563 7446 7620 6578 706c 6169 6e5f 5f38 4c50 4f62 6a65 6374 4650 6320 3b3b 3b00 5f5f 7074 626c 5f5f 384c
2236220 504f 626a 6563 745f 5f70 6172 616d 6574 6572 5f63 7878 3a47 2830 2c33 3329 004c 6973 743a 5428 302c 3837 293d 7331 3263
2236300 6f75 6e74 5f5f 344c 6973 743a 2830 2c31 292c 302c 3332 3b70 7472 4c4f 626a 6563 745f 5f34 4c69 7374 3a28 302c 3834 292c
2236360 3332 2c33 323b 5f5f 7670 7472 5f5f 344c 6973 743a 2830 2c33 3329 2c36 342c 3332 3b3b 004c 6973 743a 5a63 4c69 7374 3b3b
2236440 5f5f 6374 5f5f 344c 6973 7446 7620 5f5f 6374 5f5f 344c 6973 7446 5243 344c 6973 7420 5f5f 6474 5f5f 344c 6973 7446 7620
2236520 6765 7443 6f75 6e74 5f5f 344c 6973 7446 7620 6765 7454 6f70 5f5f 344c 6973 7446 7620 7365 7454 6f70 5f5f 344c 6973 7446
2236600 5037 4c4f 626a 6563 7420 6572 726f 724d 656d 6f72 795f 5f34 4c69 7374 4650 6354 3120 6272 6f61 6463 6173 745f 5f34 4c69
2236660 7374 464d 364f 626a 6563 7446 765f 7620 6578 706c 6169 6e5f 5f34 4c69 7374 4650 6320 5c00 696e 7365 7274 5f5f 344c 6973
2236740 7446 5037 4c4f 626a 6563 7420 6973 4d65 6d62 6572 5f5f 344c 6973 7446 5037 4c4f 626a 6563 7420 6973 4d65 6d62 6572 5f5f
2237020 344c 6973 7446 5063 2069 7345 7175 616c 5f5f 344c 6973 7446 5234 4c69 7374 2072 656d 6f76 655f 5f34 4c69 7374 4650 6320
2237100 3b3b 3b00 5f5f 7074 626c 5f5f 344c 6973 745f 5f70 6172 616d 6574 6572 5f63 7878 3a47 2830 2c33 3329 0050 4c69 7374 3a54
2237160 2830 2c38 3829 3173 3132 636f 756e 745f 5f34 4c69 7374 3a28 302c 3129 2c30 2c33 323b 7074 724c 4f62 6a65 6374 5f5f 344c
2237240 6973 743a 2830 2c38 3429 2c33 322c 3332 3b5f 5f76 7074 725f 5f34 4c69 7374 3a28 302c 3333 292c 3634 2c33 323b 3b00 504c
2237320 6973 743a 5a63 504c 6973 743b 4c69 7374 3b69 6e73 6572 745f 5f35 504c 6973 7446 5038 4c50 4f62 6a65 6374 2069 6e73 6572
2237400 745f 5f35 504c 6973 7446 5235 504c 6973 7420 536f 7274 5f50 4c69 7374 5f5f 3550 4c69 7374 4669 2072 6576 6572 7365 5f5f
2237460 3550 4c69 7374 4676 2069 6e73 6572 7441 6674 6572 5f5f 3550 4c69 7374 4650 384c 504f 626a 6563 7454 3120 7265 6d6f 7665
2237540 5f5f 3550 4c69 7374 4650 384c 504f 626a 6563 7420 7265 6d6f 7665 5f5f 3550 4c69 7374 4650 6320 6973 4d65 6d62 6572 5f5f
2237620 3550 4c69 7374 4650 6320 5c00 6973 4d65 6d62 6572 5f5f 3550 4c69 7374 4650 374c 4f62 6a65 6374 2069 7345 7175 616c 5f5f
2237700 3550 4c69 7374 4652 344c 6973 7420 6578 706c 6169 6e5f 5f35 504c 6973 7446 5063 205f 5f63 745f 5f35 504c 6973 7446 5243
2237760 3550 4c69 7374 205f 5f63 745f 5f35 504c 6973 7446 7620 3b3b 3b00 5f5f 7074 626c 5f5f 3550 4c69 7374 5f5f 7061 7261 6d65
2240040 7465 725f 6378 743a 4728 302c 3333 2900 4c69 7374 4974 6572 6174 6f72 3a54 2830 2c38 3929 3d73 386c 6973 745f 5f31 324c
2240120 6973 7449 7465 7261 746f 723a 2830 2c39 3029 3d2a 2830 2c38 3729 2c39 2c33 323b 705f 5f31 324c 6973 7449 7465 7261 746f
2240200 723a 2830 2c38 3429 2c33 322c 3332 3b3b 004c 6973 7449 7465 7261 746f 723a 5a63 4c69 7374 4974 6572 6174 6f72 3b3b 5f5f
2240260 6374 5f5f 3132 4c69 7374 4974 6572 6174 6f72 4652 344c 6973 7420 7265 7365 745f 5f31 324c 6973 7449 7465 7261 746f 7246
2240340 7620 6174 7461 6368 5f5f 3132 4c69 7374 4974 6572 6174 6f72 4652 344c 6973 7420 6765 7443 7572 7265 6e74 5f5f 3132 4c69
2240420 7374 4974 6572 6174 6f72 4676 205f 5f70 705f 5f31 324c 6973 7449 7465 7261 746f 7246 7620 3b3b 3b00 5069 6e4c 656e 6774
2240500 683a 5428 302c 3931 293d 7331 365f 5f76 7074 725f 5f36 4f62 6a65 6374 3a28 302c 3333 292c 302c 3332 3b6e 616d 655f 5f37
2240560 4e4f 626a 6563 743a 2830 2c32 3329 2c33 322c 3332 3b43 6c65 6e67 7468 5f5f 3950 696e 4c65 6e67 7468 3a28 302c 3230 292c
2240640 3634 2c33 323b 496c 656e 6774 685f 5f39 5069 6e4c 656e 6774 683a 2830 2c31 292c 3936 2c33 323b 3b00 5069 6e4c 656e 6774
2240720 683a 5a63 5069 6e4c 656e 6774 683b 4e4f 626a 6563 743b 5f5f 6374 5f5f 3950 696e 4c65 6e67 7468 4650 6354 3120 5f5f 6374
2241000 5f5f 3950 696e 4c65 6e67 7468 4652 4339 5069 6e4c 656e 6774 6820 7365 745f 5069 6e4c 656e 6774 685f 5f39 5069 6e4c 656e
2241060 6774 6946 5063 5431 2067 6574 5f49 5f50 696e 4c65 6e67 7468 5f5f 3950 696e 4c65 6e67 7468 4676 2067 6574 5f49 5f50 696e
2241140 4c65 6e67 7468 5f5f 3950 696e 4c65 6e67 7468 4669 203b 3b3b 004d 6f64 4765 6e3a 5428 302c 3932 293d 7332 3442 6974 5769
2241220 6474 685f 5f36 416f 6447 656e 3a28 302c 3129 2c30 2c33 323b 4553 7461 7465 5f5f 364d 6f64 4765 6e3a 2830 2c37 3829 2c33
2241300 322c 3332 3b50 696e 4e61 6d65 4c65 6e67 7468 5f5f 364d 6f64 4765 6e3a 2830 2c38 3829 2c36 342c 3936 3b5f 5f76 7074 725f
2241360 5f36 4d6f 6447 656e 3a28 302c 3333 292c 3136 302c 3332 3b3b 004d 6f64 4765 6e3a 5a63 4d6f 6447 656e 3b3b 5f5f 6374 5f5f
2241440 364d 6f64 4765 6e46 7620 5f5f 6374 5f5f 364d 6f64 4765 6e46 5243 364d 6f64 4765 6e20 7365 745f 4269 7457 6964 7468 5f5f
2241520 364d 6f64 4765 6e46 6920 7365 745f 4553 7461 7465 5f5f 364d 6f64 4765 6e46 3742 6f6f 6c65 616e 2067 6574 5f45 5374 6174
2241600 655f 5f36 4d6f 6447 656e 4676 2073 6574 5f50 696e 4c65 6e67 7468 5f5f 364d 6f64 4765 6e46 5063 5431 2067 6574 5f50 696e
```

| | | | | | | | | | | | | | | | | | | | | | | | | |
|---|---|---|---|---|---|---|---|---|---|---|---|---|---|---|---|---|---|---|---|---|---|---|---|---|
| 2241660 | 4c65 | 6e67 | 7468 | 5f5f | 364d | 6f64 | 4765 | 6e46 | 5063 | 2073 | 6574 | 496e | 6465 | 785f | 5f36 | 4d6f | 6447 | 656e | 4676 | 205c | 0073 | 6574 | 4e61 | 6d65 |
| 2241740 | 496e | 6465 | 785f | 5f36 | 4d6f | 6447 | 656e | 4650 | 6320 | 4c6f | 6164 | 5f56 | 4344 | 4c5f | 4461 | 7461 | 5f5f | 364d | 6f64 | 4765 | 6e46 | 5037 | 4e4f | 626a |
| 2242020 | 6563 | 7420 | 436f | 6473 | 6f73 | 655f | 416f | 6447 | 656e | 5f44 | 6573 | 6372 | 6970 | 746f | 725f | 5f36 | 4d6f | 6447 | 656e | 4650 | 6320 | 6578 | 706c | 6169 |
| 2242100 | 6e5f | 5f36 | 4d6f | 6447 | 656e | 4676 | 205f | 5f64 | 745f | 5f36 | 4d6f | 6447 | 656e | 4676 | 203b | 3b3b | 005f | 5f70 | 7462 | 6c5f | 5f36 | 4d6f | 6447 | 656e |
| 2242160 | 5f5f | 7061 | 7261 | 6465 | 7465 | 725f | 6378 | 7d3a | 4728 | 302c | 3333 | 2900 | 5f5f | 4335 | 353a | 5428 | 302c | 3933 | 293d | 7534 | 7376 | 616c | 7565 | 3a28 |
| 2242240 | 302c | 3230 | 292c | 302c | 3332 | 3b69 | 7661 | 6c75 | 653a | 2830 | 2c31 | 292c | 302c | 3332 | 3b66 | 7661 | 6c75 | 653a | 2830 | 2c39 | 292c | 302c | 3332 | 3b3b |
| 2242320 | 005f | 5f43 | 3535 | 3a5a | 635f | 5f43 | 3535 | 3b3b | 3b3b | 3b00 | 4765 | 6e56 | 616c | 7565 | 3a54 | 2830 | 2c39 | 3429 | 3d73 | 3136 | 5f5f | 7670 | 7472 | 5f5f |
| 2242400 | 364f | 626a | 6563 | 743a | 2830 | 2c33 | 3329 | 2c30 | 2c33 | 323b | 6e61 | 6d65 | 5f5f | 374e | 4f62 | 6a65 | 6374 | 3a28 | 302c | 3230 | 292c | 3332 | 2c33 | 323b |
| 2242460 | 7479 | 7065 | 5f5f | 3847 | 656e | 5661 | 6c75 | 653a | 2830 | 2c37 | 3229 | 2c36 | 342c | 3332 | 3b5f | 5f4f | 3535 | 5f5f | 3847 | 656e | 5661 | 6c75 | 653a | 2830 |
| 2242540 | 2c39 | 3329 | 2c39 | 362c | 3332 | 3b3b | 0047 | 656e | 5661 | 6c75 | 653a | 5a63 | 4765 | 6e56 | 616c | 7565 | 3b4e | 4f62 | 6a65 | 6374 | 3b5f | 5f63 | 745f | 5f38 |
| 2242620 | 4765 | 6e56 | 616c | 7565 | 4676 | 205f | 5f63 | 745f | 5f38 | 4765 | 6e56 | 616c | 7565 | 4652 | 4338 | 4765 | 6e56 | 616c | 7565 | 205f | 5f64 | 745f | 5f38 | 4765 |
| 2242700 | 6e56 | 616c | 7565 | 4676 | 2073 | 6574 | 5f47 | 656e | 5661 | 6c75 | 655f | 7479 | 7065 | 5f5f | 3847 | 656e | 5661 | 6c75 | 6546 | 5063 | 6920 | 7365 | 745f | 4765 |
| 2242760 | 6e56 | 616c | 7565 | 5f74 | 7970 | 655f | 5f38 | 4765 | 6e56 | 616c | 7565 | 4631 | 3056 | 616c | 7565 | 5f54 | 7970 | 6520 | 7365 | 745f | 4765 | 6e56 | 616c | 7565 |
| 2243040 | 5f5f | 3847 | 656e | 5661 | 6c75 | 6546 | 5063 | 205c | 0073 | 6574 | 5f47 | 656e | 5661 | 6c75 | 655f | 5f38 | 4765 | 6e56 | 616c | 7565 | 4669 | 2073 | 6574 | 5f47 |
| 2243120 | 656e | 5661 | 6c75 | 655f | 5f38 | 4765 | 6e56 | 616c | 7565 | 4666 | 2067 | 6574 | 5f47 | 656e | 5661 | 6c75 | 655f | 7479 | 7065 | 5f5f | 3847 | 656e | 5661 | 6c75 |
| 2243200 | 6546 | 7620 | 6765 | 745f | 4765 | 6e56 | 616c | 7565 | 5f73 | 5f5f | 3847 | 656e | 5661 | 6c75 | 6546 | 7620 | 6765 | 745f | 4765 | 6e56 | 616c | 7565 | 5f69 | 5f5f |
| 2243260 | 3847 | 656e | 5661 | 6c75 | 6546 | 7620 | 6765 | 745f | 4765 | 6e56 | 616c | 7565 | 5f66 | 5f5f | 3847 | 656e | 5661 | 6c75 | 6546 | 7620 | 6578 | 706c | 6169 | 6e5f |
| 2243340 | 5f38 | 4765 | 6e56 | 616c | 7565 | 4650 | 6320 | 5c00 | 6369 | 6563 | 6b5f | 5f38 | 4765 | 6e56 | 616c | 7565 | 4669 | 203b | 3b3b | 005f | 5f70 | 7462 | 6c5f | 5f38 |
| 2243420 | 4765 | 6e56 | 616c | 7565 | 5f5f | 7061 | 7261 | 6d65 | 7465 | 725f | 6378 | 783a | 4728 | 302c | 3333 | 2900 | 656e | 7469 | 7479 | 3a54 | 2830 | 2c39 | 3529 | 3d73 |
| 2243500 | 3630 | 5f5f | 7670 | 7472 | 5f5f | 364f | 626a | 6563 | 743a | 2830 | 2c33 | 3329 | 2c30 | 2c33 | 323b | 6e61 | 6d65 | 5f5f | 374e | 4f62 | 6a65 | 6374 | 3a28 | 302c |
| 2243560 | 3230 | 292c | 3332 | 2c33 | 323b | 6e61 | 6d65 | 5f5f | 3665 | 6e74 | 6974 | 793a | 2830 | 2c32 | 3029 | 2c36 | 342c | 3332 | 3b46 | 696c | 654e | 616d | 655f | 5f36 |
| 2243640 | 656e | 7469 | 7479 | 3a28 | 302c | 3230 | 292c | 3936 | 2c33 | 323b | 6172 | 6368 | 6e61 | 6d65 | 5f5f | 3665 | 6e74 | 6974 | 793a | 2830 | 2c32 | 3029 | 2c31 | 3238 |
| 2243720 | 2c33 | 323b | 7479 | 7065 | 5f5f | 3665 | 6e74 | 6974 | 793a | 2830 | 2c31 | 292c | 3136 | 302c | 3332 | 3b61 | 7263 | 685f | 6c69 | 6e65 | 5f5f | 3665 | 6e74 | 6974 |
| 2244000 | 793a | 2830 | 2c31 | 292c | 3139 | 322c | 3332 | 3b63 | 616c | 6c5f | 6c69 | 6e65 | 5f5f | 3665 | 6e74 | 6974 | 793a | 2830 | 2c31 | 292c | 3232 | 342c | 3332 | 3b5c |
| 2244060 | 0070 | 7263 | 735f | 6c69 | 6e65 | 5f5f | 3665 | 6e74 | 6974 | 793a | 2830 | 2c31 | 292c | 3235 | 362c | 3332 | 3b71 | 7561 | 6c69 | 6669 | 6564 | 5f5f | 3665 | 6e74 |
| 2244140 | 6974 | 793a | 2830 | 2c38 | 3829 | 2c32 | 3938 | 2c39 | 363b | 7375 | 625f | 626c | 6f63 | 6b73 | 5f5f | 3665 | 6e74 | 6974 | 793a | 2830 | 2c38 | 3829 | 2c33 | 3834 |
| 2244220 | 2c39 | 363b | 3b00 | 656e | 7469 | 7479 | 3a5a | 6365 | 6e74 | 6974 | 793b | 4e4f | 626a | 6563 | 743b | 5f5f | 6374 | 5f5f | 3665 | 6e74 | 6974 | 7946 | 7620 | 5f5f |
| 2244300 | 6374 | 5f5f | 3665 | 6e74 | 6974 | 7946 | 5243 | 3665 | 6e74 | 6974 | 7920 | 5f5f | 6474 | 5f5f | 3665 | 6e74 | 6974 | 7946 | 7620 | 7365 | 745f | 656e | 7469 | 7479 |
| 2244360 | 5f6e | 616d | 655f | 5f36 | 656e | 7469 | 7479 | 4650 | 6320 | 7365 | 745f | 656e | 7469 | 7479 | 5f66 | 696c | 655f | 5f36 | 656e | 7469 | 7479 | 4650 | 6320 | 7365 |
| 2244440 | 745f | 656e | 7469 | 7479 | 5f61 | 7263 | 686e | 616d | 655f | 5f36 | 656e | 7469 | 7479 | 4650 | 6320 | 7365 | 745f | 656e | 7469 | 7479 | 5f74 | 7970 | 655f | 5f36 |
| 2244520 | 656e | 7469 | 7479 | 4650 | 6320 | 5c00 | 7365 | 745f | 6172 | 6368 | 5f6c | 696e | 655f | 5f36 | 656e | 7469 | 7479 | 4669 | 2073 | 6574 | 5f63 | 616c | 6c5f | 6c69 |
| 2244600 | 6e65 | 5f5f | 3665 | 6e74 | 6974 | 7946 | 6920 | 7365 | 745f | 7072 | 6373 | 5f6c | 696e | 655f | 5f36 | 656e | 7469 | 7479 | 4669 | 2067 | 6574 | 5f65 | 6e74 | 6974 |
| 2244660 | 795f | 6e61 | 6d65 | 5f5f | 3665 | 6e74 | 6974 | 7946 | 7620 | 6765 | 745f | 656e | 7469 | 7479 | 5f61 | 7263 | 686e | 616d | 655f | 5f36 | 656e | 7469 | 7479 | 4676 |
| 2244740 | 2067 | 6574 | 5f65 | 6e74 | 6974 | 795f | 6669 | 6c65 | 5f5f | 3665 | 6e74 | 6974 | 7946 | 7620 | 6765 | 745f | 656e | 7469 | 7479 | 5f74 | 7970 | 655f | 5f36 | 656e |
| 2245020 | 7469 | 7479 | 4676 | 205c | 0067 | 6574 | 5f61 | 7263 | 685f | 6c69 | 6e65 | 5f5f | 3665 | 6e74 | 6974 | 7946 | 7620 | 6765 | 745f | 6361 | 6c6c | 5f6c | 696e | 655f |
| 2245100 | 5f36 | 656e | 7469 | 7479 | 4676 | 2067 | 6574 | 5f70 | 7263 | 735f | 6c69 | 6e65 | 5f5f | 3665 | 6e74 | 6974 | 7946 | 7620 | 6973 | 4754 | 455f | 5f36 | 656e | 7469 |
| 2245160 | 7479 | 4650 | 364f | 626a | 6563 | 7420 | 6973 | 4c54 | 455f | 5f36 | 656e | 7469 | 7479 | 4650 | 364f | 626a | 6563 | 7420 | 6578 | 706c | 6169 | 6e5f | 5f36 | 656e |
| 2245240 | 7469 | 7479 | 4650 | 6320 | 3b3b | 3b00 | 5f5f | 7074 | 626c | 5f5f | 3665 | 6e74 | 6974 | 795f | 5f70 | 6172 | 616d | 6574 | 6572 | 5f63 | 7878 | 3a47 | 2830 | 2c33 |
| 2245320 | 3329 | 0062 | 6c6f | 636b | 3a54 | 2830 | 2c39 | 3629 | 3d73 | 3134 | 305f | 5f76 | 7074 | 725f | 5f36 | 4f62 | 6a65 | 6374 | 3a28 | 302c | 3333 | 292c | 302c | 3332 |
| 2245400 | 3b6e | 616d | 655f | 5f37 | 4e4f | 626a | 6563 | 743a | 2830 | 2c32 | 3029 | 2c33 | 322c | 3332 | 3b6e | 616d | 655f | 5f35 | 626c | 6f63 | 6b3a | 2830 | 2c32 | 3029 |
| 2245460 | 2c36 | 342c | 3332 | 3b74 | 7970 | 655f | 5f35 | 626c | 6f63 | 6b3a | 2830 | 2c31 | 292c | 3936 | 2c33 | 323b | 4d47 | 5f4e | 616d | 655f | 5f35 | 626c | 6f63 | 6b3a |
| 2245540 | 2830 | 2c32 | 3029 | 2c31 | 3238 | 2c33 | 323b | 4d47 | 5f54 | 7970 | 655f | 5f35 | 626c | 6f63 | 6b3a | 2830 | 2c32 | 3029 | 2c31 | 3630 | 2c33 | 323b | 4d47 | 5f53 |
| 2245620 | 7562 | 5479 | 7065 | 5f5f | 3562 | 6c6f | 636b | 3a28 | 302c | 3230 | 292c | 3139 | 322c | 3332 | 3b50 | 6172 | 656e | 745f | 5f35 | 626c | 6f63 | 6b3a | 2830 | 2c39 |
| 2245700 | 3529 | 2c32 | 3234 | 2c34 | 3830 | 3b5c | 004d | 4744 | 7363 | 7270 | 746e | 5f5f | 3562 | 6c6f | 636b | 3a28 | 302c | 3937 | 293d | 2a28 | 302c | 3932 | 292c | 3730 |
| 2245760 | 342c | 3332 | 3b41 | 6374 | 7561 | 6c5f | 5f35 | 626c | 6f63 | 6b3a | 2830 | 2c38 | 3929 | 2c37 | 3336 | 2c39 | 363b | 466f | 726d | 616c | 5f5f | 3562 | 6c6f | 636b |
| 2246040 | 3a28 | 302c | 3838 | 292c | 3833 | 322c | 3936 | 3b52 | 6573 | 6f6c | 7665 | 645f | 5f35 | 626c | 6f63 | 6b3a | 2830 | 2c38 | 3829 | 2c39 | 3238 | 2c39 | 363b | 4174 |
| 2246120 | 7472 | 6962 | 7574 | 6573 | 5f5f | 3562 | 6c6f | 636b | 3a28 | 302c | 3838 | 292c | 3130 | 3234 | 2c39 | 363b | 3b00 | 626c | 6f63 | 6b3a | 5a63 | 626c | 6f63 | 6b3b |
| 2246200 | 4e4f | 626a | 6563 | 743b | 5f5f | 6374 | 5f5f | 3562 | 6c6f | 636b | 4676 | 205f | 5f63 | 745f | 5f35 | 626c | 6f63 | 6b46 | 5243 | 3562 | 6c6f | 636b | 205f | 5f64 |
| 2246260 | 745f | 5f35 | 626c | 6f63 | 6b46 | 7620 | 7365 | 745f | 626c | 6f63 | 6b5f | 6e61 | 6d65 | 5f5f | 3562 | 6c6f | 636b | 4650 | 6320 | 7365 | 745f | 626c | 6f63 | 6b5f |
| 2246340 | 7479 | 7065 | 5f5f | 3562 | 6c6f | 636b | 4650 | 6320 | 6765 | 745f | 626c | 6f63 | 6b5f | 6e61 | 6d65 | 5f5f | 3562 | 6c6f | 636b | 4676 | 2067 | 6574 | 5f62 | 6c6f |
| 2246420 | 636b | 5f74 | 7970 | 655f | 5f35 | 626c | 6f63 | 6b46 | 7620 | 6765 | 745f | 626c | 6f63 | 6b5f | 7061 | 7265 | 6e74 | 5f5f | 3562 | 6c6f | 636b | 4676 | 205c | 0067 |
| 2246500 | 6574 | 5f62 | 6c6f | 636b | 5f4d | 6f64 | 4765 | 6e5f | 5f35 | 626c | 6f63 | 6b46 | 7620 | 6765 | 745f | 466f | 726d | 616c | 5f5f | 3562 | 6c6f | 636b | 4676 | 2067 |
| 2246560 | 6574 | 5f41 | 6374 | 7561 | 6c5f | 5f35 | 626c | 6f63 | 6b46 | 7620 | 6765 | 745f | 5265 | 736f | 6c76 | 6564 | 5f5f | 3562 | 6c6f | 636b | 4676 | 2067 | 6574 | 5f41 |
| 2246640 | 7474 | 7269 | 6275 | 7465 | 5f5f | 3562 | 6c6f | 636b | 4676 | 2067 | 6574 | 5f63 | 6f6d | 705f | 6c65 | 6e67 | 7468 | 5f5f | 3562 | 6c6f | 636b | 4676 | 2069 | 7351 |
| 2246720 | 7561 | 6c69 | 6669 | 6564 | 5f5f | 3562 | 6c6f | 636b | 4676 | 2069 | 734c | 5445 | 5f5f | 3562 | 6c6f | 636b | 4650 | 364f | 626a | 6563 | 7420 | 5c00 | 6973 | 4754 |

```
2247000 455f 5f35 626c 6f63 6b46 5036 4f62 6a65 6374 2065 7870 6c61 696e 5f5f 3562 6c6f 636b 4650 6320 5265 7665 7273 6541 6c6c
2247060 4c69 7374 735f 5f35 626c 6f63 6b46 7620 4369 6563 6b50 6172 614c 6973 7473 5f5f 3562 6c6f 636b 4676 2043 6865 636b 5061
2247140 7261 6d4c 6973 745f 5f35 626c 6f63 6b46 5035 504c 6973 7420 575f 5648 444c 5f43 6f6d 7049 6e73 745f 5f35 626c 6f63 6b46
2247220 7620 575f 5648 444c 5f43 6f6d 7044 6563 5f5f 3562 6c6f 636b 4676 2067 6574 5f56 4844 4c5f 436f 6d70 4c61 626c 655f 5f35
2247300 626c 6f63 6b46 5063 205c 0067 6574 5f56 4844 4c5f 436f 6d70 4e61 6d65 5f5f 3562 6c6f 636b 4650 6320 575f 4d47 5f43 6f6d
2247360 7044 7363 7270 746e 5f5f 3562 6c6f 636b 4676 2057 5f4d 475f 4368 6563 6b43 6f6d 705f 5f35 626c 6f63 6b46 7620 575f 434c
2247440 5f41 7263 6842 6f64 795f 5f35 626c 6f63 6b46 7620 575f 434c 5f45 6e74 6974 7944 6563 5f5f 3562 6c6f 636b 4676 203b 3b3b
2247520 005f 5f70 7462 6c5f 5f35 626c 6f63 6b5f 5f70 6172 616d 6574 6572 5f63 7878 3a47 2830 2c33 3329 005f 5f63 745f 5f36 656e
2247600 7469 7479 4676 3a66 2830 2c39 3829 3d2a 2830 2c39 3529 005f 5f30 7468 6973 3a70 2830 2c39 3829 002e 2f68 7878 2f65 6e74
2247660 6974 792e 6878 7800 5f5f 3074 6869 733a 7228 302c 3938 2900 5f5f 3074 6869 7320 3a5a 746c 005f 5f63 745f 5f36 656e 7469
2247740 7479 4676 203a 5a74 4600 7061 7261 6d65 7465 723a 5428 302c 3939 293d 7336 305f 5f76 7074 725f 5f36 4f62 6a65 6374 3a28
2250020 302c 3333 292c 302c 3332 3b6e 616d 655f 5f37 4e4f 626a 6563 743a 2830 2c32 3029 2c33 322c 3332 3b6e 616d 655f 5f39 7061
2250100 7261 6d65 7465 723a 2830 2c32 3029 2c36 342c 3332 3b74 7970 655f 5f39 7061 7261 6d65 7465 723a 2830 2c32 3029 2c39 362c
2250160 3332 3b72 616e 6765 5f5f 3970 6172 616d 6574 6572 3a28 302c 3230 292c 3132 382c 3332 3b73 6c69 6365 5f5f 3970 6172 616d
2250240 6574 6572 3a28 302c 3230 292c 3136 302c 3332 3b53 6c6f 775f 5f39 7061 7261 6d65 7465 723a 2830 2c31 292c 3139 322c 3332
2250320 3b53 6869 6768 5f5f 3970 6172 616d 6574 6572 3a28 302c 3129 2c32 3234 2c33 323b 5c00 5043 6c61 7373 5f5f 3970 6172 616d
2250400 6574 6572 3a28 302c 3736 292c 3235 362c 3332 3b50 5852 6566 5f5f 3970 6172 616d 6574 6572 3a28 302c 3130 3029 3d2a 2830
2250460 2c39 3929 2c32 3338 2c33 323b 6d6f 6465 5f5f 3970 6172 616d 6574 6572 3a28 302c 3735 292c 3332 302c 3332 3b76 616c 7565
2250540 5f5f 3970 6172 616d 6574 6572 3a28 302c 3934 292c 3335 322c 3132 383b 3b00 7061 7261 6d65 7465 723a 5a63 7061 7261 6d65
2250620 7465 723b 4e4f 626a 6563 743b 5f5f 6374 5f5f 3970 6172 616d 6574 6572 4676 205f 5f63 745f 5f39 7061 7261 6d65 7465 7246
2250700 5243 3970 6172 616d 6574 6572 205f 5f64 745f 5f39 7061 7261 6d65 7465 7246 7620 6765 745f 7061 7261 6d65 7465 725f 6d6f
2250760 6465 5f5f 3970 6172 616d 6574 6572 4676 2067 6574 5f70 6172 616d 6574 6572 5f63 6c61 7373 5f5f 3970 6172 616d 6574 6572
2251040 4676 2067 6574 5f70 6172 615f 736c 6f77 5f5f 3970 6172 616d 6574 6572 4676 205c 0067 6574 5f70 6172 615f 7368 6967 685f
2251120 5f39 7061 7261 6d65 7465 7246 7620 6765 745f 7061 7261 6d65 7465 725f 7261 6e67 655f 5f39 7061 7261 6d65 7465 7246 7620
2251200 6765 745f 7061 7261 6d65 7465 725f 7479 7065 5f5f 3970 6172 616d 6574 6572 4676 2067 6574 5f70 6172 616d 6574 6572 5f6e
2251260 616d 655f 5f39 7061 7261 6d65 7465 7246 7620 6765 745f 7061 7261 6d65 7465 725f 736c 6963 655f 5f39 7061 7261 6d65 7465
2251340 7246 7620 6765 745f 7061 7261 6d65 7465 725f 5058 5245 465f 5f39 7061 7261 6d65 7465 7246 3130 5061 7261 5f43 6c61 7373
2251420 205c 0067 6574 5f63 6f72 7265 6374 5f6c 656e 6774 685f 5f39 7061 7261 6d65 7465 7246 7620 6765 745f 7061 7261 5f6c 656e
2251500 6774 685f 5f39 7061 7261 6d65 7465 7246 7620 6765 745f 7061 7261 5f73 7461 7475 735f 5f39 7061 7261 6d65 7465 7246 7620
2251560 6765 745f 7061 7261 6d65 7465 725f 7661 6c75 655f 5f39 7061 7261 6d65 7465 7246 7620 6765 745f 7061 7261 6d65 7465 725f
2251640 7661 6c75 655f 7479 7065 5f5f 3970 6172 616d 6574 6572 4676 2067 6574 5f70 6172 616d 6574 6572 5f73 7661 6c75 655f 5f39
2251720 7061 7261 6d65 7465 7246 7620 5c00 6765 745f 7061 7261 6d65 7465 725f 6976 616c 7565 5f5f 3970 6172 616d 6574 6572 4676
2252000 2067 6574 5f70 6172 616d 6574 6572 5f66 7661 6c75 655f 5f39 7061 7261 6d65 7465 7246 7620 7365 745f 7061 7261 6d65 7465
2252060 725f 6e61 6d65 5f5f 3970 6172 616d 6574 6572 4650 6320 7365 745f 7061 7261 6d65 7465 725f 636c 6173 735f 5f39 7061 7261
2252140 6d65 7465 7246 3130 5061 7261 5f43 6c61 7373 2073 6574 5f70 6172 616d 6574 6572 5f74 7970 655f 5f39 7061 7261 6d65 7465
2252220 7246 5063 2073 6574 5f70 6172 616d 6574 6572 5f73 6c69 6365 5f5f 3970 6172 616d 6574 6572 4650 6320 5c00 7365 745f 7061
2252300 7261 6d65 7465 725f 7372 616e 6765 5f5f 3970 6172 616d 6574 6572 4650 6320 7365 745f 7061 7261 6d65 7465 725f 5058 5265
2252360 665f 5f39 7061 7261 6d65 7465 7246 5063 5035 626c 6f63 6b20 7365 745f 7061 7261 6d65 7465 725f 7261 6e67 655f 5f39 7061
2252440 7261 6d65 7465 7246 5063 2073 6574 5f70 6172 616d 6574 6572 5f6d 6f64 655f 5f39 7061 7261 6d65 7465 7246 5063 2073 6574
2252520 5f70 6172 616d 6574 6572 5f76 616c 7565 5f5f 3970 6172 616d 6574 6572 4650 6320 7365 745f 7061 7261 6d65 7465 725f 7661
2252600 6c75 655f 5f39 7061 7261 6d65 7465 7246 6920 5c00 7365 745f 7061 7261 6d65 7465 725f 7661 6c75 655f 5f39 7061 7261 6d65
2252660 7465 7246 6620 7365 745f 7061 7261 6d65 7465 725f 7661 6c75 655f 7479 7065 5f5f 3970 6172 616d 6574 6572 4650 6320 6765
2252740 745f 5648 444c 5f46 6f72 6d61 6c5f 5061 7261 6d5f 5f39 7061 7261 6d65 7465 7246 5063 6920 6765 745f 5648 444c 5f50 726d
2253020 7472 5f5f 3970 6172 616d 6574 6572 4650 6369 2067 6574 5f56 4844 4c5f 4578 7061 6e64 6564 5f46 6f72 6d61 6c5f 5061 7261
2253100 6d5f 5f39 7061 7261 6d65 7465 7246 5035 626c 6f63 6b50 6369 205c 0067 6574 5f56 4844 4c5f 4578 7061 6e64 6564 5f50 726d
2253160 7472 5f4d 6170 5f5f 3970 6172 616d 6574 6572 4650 3562 6c6f 636b 5063 6920 6578 706c 6169 6e5f 5f39 7061 7261 6d65 7465
2253240 7246 5063 203b 3b3b 005f 5f70 7462 6c5f 5f39 7061 7261 6d65 7465 725f 5f70 6172 616d 6574 6572 5f63 7878 3a47 2830 2c33
2253320 3329 0074 656d 703a 4728 302c 3130 3129 3d61 7228 302c 3129 3b30 3b37 393b 2830 2c32 2900 7465 6d70 323a 4728 302c 3130
2253400 3229 3d61 7228 302c 3129 3b30 3b31 353b 2830 2c32 2900 6370 313a 4728 302c 3230 2900 7061 7261 6d65 7465 722e 6378 7800
2253460 6370 323a 4728 302c 3230 2900 6964 656e 7461 7469 6f6e 3a47 2830 2c31 3033 293d 6172 2830 2c31 293b 303b 3439 3b28 302c
2253540 3229 0069 646e 746e 3a47 2830 2c32 3029 0065 7870 6c61 696e 5f5f 3970 6172 616d 6574 6572 4650 633a 4628 302c 3229 005f
2253620 5f30 7468 6973 3a70 2830 2c31 3030 2900 5f5f 3073 3a70 2830 2c32 3029 005f 5f30 7468 6973 3a72 2830 2c31 3030 2900 5f5f
2253700 3074 6869 7320 3a5a 746c 005f 5f30 7320 3a5a 746c 0065 7870 6c61 696e 5f5f 3970 6172 616d 6574 6572 4650 6320 3a5a 7446
2253760 0073 6574 5f70 6172 616d 6574 6572 5f6d 6f64 655f 5f39 7061 7261 6d65 7465 7246 5063 3a46 2830 2c32 2900 5f5f 3074 6869
2254040 733a 7028 302c 3130 3029 005f 5f30 733a 7028 302c 3230 2900 5f5f 3074 6869 733a 7228 302c 3130 3029 005f 5f30 7468 6973
```

| | | | | | | | | | | | | | | | | | | | | | | | | |
|---|---|---|---|---|---|---|---|---|---|---|---|---|---|---|---|---|---|---|---|---|---|---|---|---|
| 2254120 | 203a | 5a74 | 6c00 | 5f5f | 3073 | 203a | 5a74 | 6c00 | 7365 | 745f | 7061 | 7261 | 6d65 | 7465 | 725f | 6d6f | 6465 | 5f5f | 3970 | 6172 | 616d | 6574 | 6572 | 4650 |
| 2254200 | 6320 | 3a5a | 7446 | 0073 | 6574 | 5f70 | 6172 | 616d | 6574 | 6572 | 5f50 | 5852 | 6566 | 5f5f | 3970 | 6172 | 616d | 6574 | 6572 | 4650 | 6350 | 3562 | 6c6f | 636b |
| 2254260 | 3a46 | 2830 | 2c32 | 2900 | 5f5f | 3074 | 6869 | 733a | 7028 | 302c | 3130 | 3029 | 005f | 5f30 | 733a | 7028 | 302c | 3230 | 2900 | 5f5f | 3042 | 3a70 | 2830 | 2c31 |
| 2254340 | 3034 | 293d | 2a28 | 302c | 3936 | 2900 | 5f5f | 3074 | 6869 | 733a | 7228 | 302c | 3130 | 3029 | 005f | 5f31 | 4c49 | 3a28 | 302c | 3839 | 2900 | 5f5f | 314c | 3a28 |
| 2254420 | 302c | 3834 | 2900 | 5f5f | 3150 | 3a28 | 302c | 3130 | 3029 | 005f | 5f30 | 5f5f | 586c | 3030 | 796d | 327a | 6765 | 3a28 | 302c | 3930 | 2900 | 5f5f | 3074 | 6869 |
| 2254500 | 7320 | 3a5a | 746c | 005f | 5f30 | 7320 | 3a5a | 746c | 005f | 5f30 | 4220 | 3a5a | 746c | 005f | 5f31 | 4c49 | 203a | 5a74 | 6c00 | 5f5f | 314c | 203a | 5a74 | 6c00 |
| 2254560 | 5f5f | 3150 | 203a | 5a74 | 6c00 | 5f5f | 305f | 5f58 | 6c30 | 3079 | 6d32 | 7a67 | 6520 | 3a5a | 746c | 005f | 5f30 | 5f5f | 586c | 3030 | 796d | 327a | 6765 | 203a |
| 2254640 | 5a72 | 0073 | 6574 | 5f70 | 6172 | 616d | 6574 | 6572 | 5f50 | 5852 | 6566 | 5f5f | 3970 | 6172 | 616d | 6574 | 6572 | 4650 | 6350 | 3562 | 6c6f | 636b | 203a | 5a74 |
| 2254720 | 4600 | 6765 | 745f | 5648 | 444c | 5f46 | 6f72 | 6d61 | 6c5f | 5061 | 7261 | 6d5f | 5f39 | 7061 | 7261 | 6d65 | 7465 | 7246 | 5063 | 693a | 4628 | 302c | 3230 | 2900 |
| 2255000 | 5f5f | 3074 | 6869 | 733a | 7028 | 302c | 3130 | 3029 | 005f | 5f30 | 6275 | 6666 | 3a70 | 2830 | 2c32 | 3029 | 005f | 5f30 | 6964 | 656e | 3a70 | 2830 | 2c31 | 2900 |
| 2255060 | 5f5f | 3074 | 6869 | 733a | 7228 | 302c | 3130 | 3029 | 005f | 5f31 | 4e6f | 5261 | 6e67 | 653a | 2830 | 2c31 | 2900 | 5f5f | 316c | 6f77 | 3a28 | 302c | 3129 | 005f |
| 2255140 | 5f31 | 6869 | 6768 | 3a28 | 302c | 3129 | 005f | 5f31 | 6963 | 703a | 2830 | 2c32 | 3029 | 005f | 5f30 | 7468 | 6973 | 203a | 5a74 | 6c00 | 5f5f | 3062 | 7566 | 6620 |
| 2255220 | 3a5a | 746c | 005f | 5f30 | 6964 | 656e | 203a | 5a74 | 6c00 | 5f5f | 314e | 6f52 | 616e | 6765 | 203a | 5a74 | 6c00 | 5f5f | 316c | 6f77 | 203a | 5a74 | 6c00 | 5f5f |
| 2255300 | 3168 | 6967 | 6820 | 3a5a | 746c | 005f | 5f31 | 6963 | 7020 | 3a5a | 746c | 0067 | 6574 | 5f56 | 4844 | 4c5f | 466f | 726d | 616c | 5f50 | 6172 | 616d | 5f5f | 3970 |
| 2255360 | 6172 | 616d | 6574 | 6572 | 4650 | 6369 | 203a | 5a74 | 4600 | 6765 | 745f | 5648 | 444c | 5f50 | 726d | 7472 | 5f5f | 3970 | 6172 | 616d | 6574 | 6572 | 4650 | 6369 |
| 2255440 | 3a46 | 2830 | 2c32 | 3029 | 005f | 5f30 | 7468 | 6973 | 3a73 | 2830 | 2c31 | 3030 | 2900 | 5f5f | 3062 | 7566 | 663a | 7028 | 302c | 3230 | 2900 | 5f5f | 3069 | 6465 |
| 2255520 | 6e3a | 7028 | 302c | 3129 | 005f | 5f30 | 7468 | 6973 | 3a72 | 2830 | 2c31 | 3030 | 2900 | 5f5f | 3169 | 6370 | 3a28 | 302c | 3230 | 2900 | 5f5f | 3074 | 6869 | 7320 |
| 2255600 | 3a5a | 746c | 005f | 5f30 | 6275 | 6666 | 203a | 5a74 | 6c00 | 5f5f | 3069 | 6465 | 6e20 | 3a5a | 746c | 005f | 5f31 | 6963 | 7020 | 3a5a | 746c | 0067 | 6574 | 5f56 |
| 2255660 | 4844 | 4c5f | 5072 | 6f74 | 725f | 5f39 | 7061 | 7261 | 6d65 | 7465 | 7246 | 5063 | 6920 | 3a5a | 7446 | 0073 | 6574 | 5f70 | 6172 | 616d | 6574 | 6572 | 5f73 | 7261 |
| 2255740 | 6e67 | 655f | 5f39 | 7061 | 7261 | 6d65 | 7465 | 7246 | 5063 | 3a46 | 2830 | 2c32 | 2900 | 5f5f | 3074 | 6869 | 733a | 7028 | 302c | 3130 | 3029 | 005f | 5f30 | 733a |
| 2256020 | 7028 | 302c | 3230 | 2900 | 5f5f | 3074 | 6869 | 733a | 7228 | 302c | 3130 | 3029 | 005f | 5f30 | 7468 | 6973 | 203a | 5a74 | 6c00 | 5f5f | 3073 | 203a | 5a74 | 6c00 |
| 2256100 | 7365 | 745f | 7061 | 7261 | 6d65 | 7465 | 725f | 7372 | 616e | 6765 | 5f5f | 3970 | 6172 | 616d | 6574 | 6572 | 4650 | 6320 | 3a5a | 7446 | 0067 | 6574 | 5f70 | 6172 |
| 2256160 | 615f | 7374 | 6174 | 7573 | 5f5f | 3970 | 6172 | 616d | 6574 | 6572 | 4676 | 3a46 | 2830 | 2c31 | 2900 | 5f5f | 3074 | 6869 | 733a | 7028 | 302c | 3130 | 3029 | 005f |
| 2256240 | 5f30 | 7468 | 6973 | 3a72 | 2830 | 2c31 | 3030 | 2900 | 5f5f | 3150 | 3a28 | 302c | 3130 | 3029 | 005f | 5f30 | 7468 | 6973 | 203a | 5a74 | 6c00 | 5f5f | 3150 | 203a |
| 2256320 | 5a74 | 6c00 | 6765 | 745f | 7061 | 7261 | 5f73 | 7461 | 7475 | 735f | 5f39 | 7061 | 7261 | 6d65 | 7465 | 7246 | 7620 | 3a5a | 7446 | 0067 | 6574 | 5f70 | 6172 | 616d |
| 2256400 | 6574 | 6572 | 5f50 | 5852 | 4546 | 5f5f | 3970 | 6172 | 616d | 6574 | 6572 | 4631 | 3050 | 6172 | 615f | 436c | 6173 | 733a | 4628 | 302c | 3130 | 3029 | 005f | 5f30 |
| 2256460 | 7468 | 6973 | 3a70 | 2830 | 2c31 | 3030 | 2900 | 5f5f | 3050 | 433a | 7028 | 302c | 3130 | 3029 | 005f | 5f30 | 7468 | 6973 | 203a | 5a74 | 6c00 | 5f5f | 3050 | 4320 |
| 2256540 | 7468 | 6973 | 203a | 5a74 | 6c00 | 5f5f | 3050 | 4320 | 3a5a | 746c | 0067 | 6574 | 5f70 | 6172 | 616d | 6574 | 6572 | 5f50 | 5852 | 4546 | 5f5f | 3970 | 6172 | 616d |
| 2256620 | 6574 | 6572 | 4631 | 3050 | 6172 | 615f | 436c | 6173 | 7320 | 3a5a | 7446 | 0067 | 6574 | 5f63 | 6f72 | 7265 | 6374 | 5f6c | 656e | 6774 | 685f | 5f39 | 7061 | 7261 |
| 2256700 | 6d65 | 7465 | 7246 | 763a | 4628 | 302c | 3129 | 005f | 5f30 | 7468 | 6973 | 3a70 | 2830 | 2c31 | 3030 | 2900 | 5f5f | 3074 | 6869 | 733a | 7228 | 302c | 3130 | 3029 |
| 2256760 | 005f | 5f31 | 503a | 2830 | 2c31 | 3030 | 2900 | 5f5f | 3074 | 6869 | 7320 | 3a5a | 746c | 005f | 5f31 | 5020 | 3a5a | 746c | 0067 | 6574 | 5f63 | 6f72 | 7265 | 6374 |
| 2257040 | 5f6c | 656e | 6774 | 685f | 5f39 | 7061 | 7261 | 6d65 | 7465 | 7246 | 7620 | 3a5a | 7446 | 0067 | 6574 | 5f70 | 6172 | 615f | 6c65 | 6e67 | 7468 | 5f5f | 3970 | 6172 |
| 2257120 | 616d | 6574 | 6572 | 4676 | 3a46 | 2830 | 2c31 | 2900 | 5f5f | 3074 | 6869 | 733a | 7028 | 302c | 3130 | 3029 | 005f | 5f30 | 7468 | 6973 | 3a72 | 2830 | 2c31 | 3030 |
| 2257200 | 2900 | 5f5f | 3074 | 6869 | 7320 | 3a5a | 746c | 0067 | 6574 | 5f70 | 6172 | 615f | 6c65 | 6e67 | 7468 | 5f5f | 3970 | 6172 | 616d | 6574 | 6572 | 4676 | 203a | 5a74 |
| 2257260 | 4600 | 6765 | 745f | 5648 | 444c | 5f45 | 7870 | 616e | 6465 | 645f | 466f | 726d | 616c | 5f50 | 6172 | 616d | 5f5f | 3970 | 6172 | 616d | 6574 | 6572 | 4650 | 3562 |
| 2257340 | 6c6f | 636b | 5063 | 693a | 4628 | 302c | 3230 | 2900 | 5f5f | 3074 | 6869 | 733a | 7028 | 302c | 3130 | 3029 | 005f | 5f30 | 423a | 7028 | 302c | 3130 | 3429 | 005f |
| 2257420 | 5f30 | 6275 | 6666 | 3a70 | 2830 | 2c32 | 3029 | 005f | 5f30 | 6964 | 656e | 3a70 | 2830 | 2c31 | 2900 | 5f5f | 3074 | 6869 | 733a | 7228 | 302c | 3130 | 3029 | 005f |
| 2257500 | 5f31 | 506c | 656e | 3a28 | 302c | 3129 | 005f | 5f31 | 693a | 2830 | 2c31 | 2900 | 5f5f | 3169 | 6370 | 3a28 | 302c | 3230 | 2900 | 5f5f | 3074 | 6869 | 7320 | 3a5a |
| 2257560 | 746c | 005f | 5f30 | 4220 | 3a5a | 746c | 005f | 5f30 | 6275 | 6666 | 203a | 5a74 | 6c00 | 5f5f | 3069 | 6465 | 6e20 | 3a5a | 746c | 005f | 5f31 | 506c | 656e | 203a |
| 2257640 | 5a74 | 6c00 | 5f5f | 3169 | 203a | 5a74 | 6c00 | 5f5f | 3169 | 6370 | 203a | 5a74 | 6c00 | 6765 | 745f | 5648 | 444c | 5f45 | 7870 | 616e | 6465 | 645f | 466f | 726d |
| 2257720 | 616c | 5f50 | 6172 | 616d | 5f5f | 3970 | 6172 | 616d | 6574 | 6572 | 4650 | 3562 | 6c6f | 636b | 5063 | 6920 | 3a5a | 7446 | 0067 | 6574 | 5f56 | 4844 | 4c5f | 4578 |
| 2260000 | 7061 | 6e64 | 6564 | 5f50 | 726d | 7472 | 5f4d | 6170 | 5f5f | 3970 | 6172 | 616d | 6574 | 6572 | 4650 | 3562 | 6c6f | 636b | 5063 | 693a | 4628 | 302c | 3230 | 2900 |
| 2260060 | 5f5f | 3074 | 6869 | 733a | 7028 | 302c | 3130 | 3029 | 005f | 5f30 | 423a | 7028 | 302c | 3130 | 3429 | 005f | 5f30 | 6275 | 6666 | 3a70 | 2830 | 2c32 | 3029 | 005f |
| 2260140 | 5f30 | 6964 | 656e | 3a70 | 2830 | 2c31 | 2900 | 5f5f | 3074 | 6869 | 733a | 7228 | 302c | 3130 | 3029 | 005f | 5f31 | 693a | 2830 | 2c31 | 2900 | 5f5f | 3150 | 6c65 |
| 2260220 | 6e3a | 2830 | 2c31 | 2900 | 5f5f | 3169 | 6370 | 3a28 | 302c | 3230 | 2900 | 5f5f | 3074 | 6869 | 7320 | 3a5a | 746c | 005f | 5f30 | 4220 | 3a5a | 746c | 005f | 5f30 |
| 2260300 | 6275 | 6666 | 203a | 5a74 | 6c00 | 5f5f | 3069 | 6465 | 6e20 | 3a5a | 746c | 005f | 5f31 | 6920 | 3a5a | 746c | 005f | 5f31 | 506c | 656e | 203a | 5a74 | 6c00 | 5f5f |
| 2260360 | 3169 | 6370 | 203a | 5a74 | 6c00 | 6765 | 745f | 5648 | 444c | 5f45 | 7870 | 616e | 6465 | 645f | 5072 | 6d74 | 725f | 4d61 | 705f | 5f39 | 7061 | 7261 | 6d65 | 7465 |
| 2260440 | 7246 | 5035 | 626c | 6f63 | 6b50 | 6369 | 203a | 5a74 | 4600 | 5f5f | 7374 | 695f | 5f70 | 6172 | 616d | 6574 | 6572 | 5f63 | 7878 | 5f63 | 7031 | 5f3a | 4628 | 302c |
| 2260520 | 3229 | 002f | 7573 | 722f | 4343 | 2f73 | 756e | 342f | 696e | 636c | 2f69 | 6f73 | 7472 | 6561 | 6d2e | 6800 | 5f5f | 7374 | 645f | 5f70 | 6172 | 616d | 6574 | 6572 |
| 2260600 | 5f63 | 7878 | 5f63 | 7031 | 5f3a | 4628 | 302c | 3229 | 005f | 5f76 | 7462 | 6c5f | 5f39 | 7061 | 7261 | 6d65 | 7465 | 723a | 4728 | 302c | 3130 | 3529 | 3d61 | 7228 |
| 2260660 | 302c | 3129 | 3b30 | 3b31 | 303b | 2830 | 2c31 | 3529 | 005f | 5f76 | 7462 | 6c5f | 5f38 | 4c50 | 4f62 | 6a65 | 6374 | 5f5f | 7061 | 7261 | 6d65 | 7465 | 725f | 6378 |
| 2260740 | 783a | 4728 | 302c | 3130 | 3629 | 3d61 | 7228 | 302c | 3129 | 3b30 | 3b33 | 3b28 | 302c | 3135 | 2900 | 7365 | 745f | 7061 | 7261 | 6d65 | 7465 | 725f | 7661 | 6c75 |
| 2261020 | 655f | 7479 | 7065 | 5f5f | 3970 | 6172 | 616d | 6574 | 6572 | 4650 | 633a | 6628 | 302c | 3229 | 005f | 5f30 | 7468 | 6973 | 3a70 | 2830 | 2c31 | 3030 | 2900 | 5f5f |
| 2261100 | 3073 | 3a70 | 2830 | 2c32 | 3029 | 002e | 2f68 | 7878 | 2f70 | 6172 | 616d | 6574 | 6572 | 2e68 | 7878 | 005f | 5f30 | 7468 | 6973 | 3a72 | 2830 | 2c31 | 3030 | 2900 |
| 2261160 | 5f5f | 3074 | 6869 | 7320 | 3a5a | 746c | 005f | 5f30 | 7320 | 3a5a | 746c | 0073 | 6574 | 5f70 | 6172 | 616d | 6574 | 6572 | 5f76 | 616c | 7565 | 5f74 | 7970 | 655f |

| | | | | | | | | | | | | | | | | | | | | | | | | |
|---|---|---|---|---|---|---|---|---|---|---|---|---|---|---|---|---|---|---|---|---|---|---|---|---|
| 2261240 | 5f39 | 7061 | 7261 | 6d65 | 7465 | 7246 | 5063 | 203a | 5a74 | 4600 | 6578 | 706c | 6169 | 6e5f | 5f38 | 4c50 | 4f62 | 6a65 | 6374 | 4650 | 633a | 6628 | 302c | 3229 |
| 2261320 | 005f | 5f30 | 7468 | 6973 | 3a70 | 2830 | 2c31 | 3037 | 293d | 2a28 | 302c | 3835 | 2900 | 5f5f | 3073 | 3a70 | 2830 | 2c32 | 3029 | 002f | 686f | 6d65 | 2f6f | 7361 |
| 2261400 | 7331 | 2f61 | 2f61 | 622f | 7372 | 632f | 6e65 | 776f | 626a | 6563 | 7473 | 2f68 | 7878 | 2f4c | 504f | 626a | 6563 | 745f | 6462 | 2e68 | 7878 | 005f | 5f30 | 7468 |
| 2261460 | 6973 | 3a72 | 2830 | 2c31 | 3037 | 2900 | 5f5f | 3074 | 6869 | 7320 | 3a5a | 746c | 005f | 5f30 | 7320 | 3a5a | 746c | 0065 | 7870 | 6c61 | 696e | 5f5f | 384c | 504f |
| 2261540 | 626a | 6563 | 7446 | 5063 | 203a | 5a74 | 4600 | 6973 | 4c54 | 455f | 5f37 | 4e4f | 626a | 6563 | 7446 | 5036 | 4f62 | 6a65 | 6374 | 3a66 | 2830 | 2c31 | 2900 | 5f5f |
| 2261620 | 3074 | 6869 | 733a | 7028 | 302c | 3836 | 2900 | 5f5f | 305f | 5f41 | 3339 | 3a70 | 2830 | 2c31 | 3038 | 293d | 2a28 | 302c | 3739 | 2900 | 2f68 | 6f6d | 652f | 6f73 |
| 2261700 | 6173 | 312f | 612f | 6162 | 2f73 | 7263 | 2f6e | 6577 | 6f62 | 6a65 | 6374 | 732f | 6878 | 782f | 4e4f | 626a | 6563 | 745f | 6462 | 2e68 | 7878 | 005f | 5f30 | 7468 |
| 2261760 | 6973 | 203a | 5a74 | 6c00 | 5f5f | 305f | 5f41 | 3339 | 203a | 5a74 | 6c00 | 6973 | 4c54 | 455f | 5f37 | 4e4f | 626a | 6563 | 7446 | 5036 | 4f62 | 6a65 | 6374 | 203a |
| 2262040 | 5a74 | 4600 | 6973 | 4754 | 455f | 5f37 | 4e4f | 626a | 6563 | 7446 | 5036 | 4f62 | 6a65 | 6374 | 3a66 | 2830 | 2c31 | 2900 | 5f5f | 3074 | 6869 | 733a | 7028 | 302c |
| 2262120 | 3836 | 2900 | 5f5f | 305f | 5f41 | 3338 | 3a70 | 2830 | 2c31 | 3038 | 2900 | 5f5f | 3074 | 6869 | 7320 | 3a5a | 746c | 005f | 5f30 | 5f5f | 4133 | 3820 | 3a5a | 746c |
| 2262200 | 0069 | 7347 | 5445 | 5f5f | 374e | 4f62 | 6a65 | 6374 | 4650 | 364f | 626a | 6563 | 7420 | 3a5a | 7446 | 0073 | 6574 | 5072 | 6f70 | 5f5f | 374e | 4f62 | 6a65 | 6374 |
| 2262260 | 4650 | 6366 | 3a66 | 2830 | 2c32 | 2900 | 5f5f | 3074 | 6869 | 733a | 7028 | 302c | 3836 | 2900 | 5f5f | 315f | 5f41 | 3336 | 3a70 | 2830 | 2c32 | 3029 | 005f | 5f31 |
| 2262340 | 5f5f | 4133 | 373a | 7028 | 302c | 3130 | 2900 | 5f5f | 3074 | 6869 | 7320 | 3a5a | 746c | 005f | 5f31 | 5f5f | 4133 | 3620 | 3a5a | 746c | 005f | 5f31 | 5f5f | 4133 |
| 2262420 | 3720 | 3a5a | 746c | 0073 | 6574 | 5072 | 6f70 | 5f5f | 374e | 4f62 | 6a65 | 6374 | 4650 | 6366 | 203a | 5a74 | 4600 | 7365 | 7450 | 726f | 705f | 5f37 | 4e4f | 626a |
| 2262500 | 6563 | 7446 | 5063 | 693a | 6628 | 302c | 3229 | 005f | 5f30 | 7468 | 6973 | 3a70 | 2830 | 2c38 | 3629 | 005f | 5f31 | 5f5f | 4133 | 343a | 7028 | 302c | 3230 | 2900 |
| 2262560 | 5f5f | 315f | 5f41 | 3335 | 3a70 | 2830 | 2c31 | 2900 | 5f5f | 3074 | 6869 | 7320 | 3a5a | 746c | 005f | 5f31 | 5f5f | 4133 | 3420 | 3a5a | 746c | 005f | 5f31 | 5f5f |
| 2262640 | 4133 | 3520 | 3a5a | 746c | 0073 | 6574 | 5072 | 6f70 | 5f5f | 374e | 4f62 | 6a65 | 6374 | 4650 | 6369 | 203a | 5a74 | 4600 | 7365 | 7450 | 726f | 705f | 5f37 | 4e4f |
| 2262720 | 626a | 6563 | 7446 | 5063 | 5431 | 3a66 | 2830 | 2c32 | 2900 | 5f5f | 3074 | 6869 | 733a | 7028 | 302c | 3836 | 2900 | 5f5f | 315f | 5f41 | 3332 | 3a70 | 2830 | 2c32 |
| 2263000 | 3029 | 005f | 5f31 | 5f5f | 4133 | 333a | 7028 | 302c | 3230 | 2900 | 5f5f | 3074 | 6869 | 7320 | 3a5a | 746c | 005f | 5f31 | 5f5f | 4133 | 3220 | 3a5a | 746c | 005f |
| 2263060 | 5f31 | 5f5f | 4133 | 3320 | 3a5a | 746c | 0073 | 6574 | 5072 | 6f70 | 5f5f | 374e | 4f62 | 6a65 | 6374 | 4650 | 6354 | 3120 | 3a5a | 7446 | 0067 | 6574 | 5072 | 6f70 |
| 2263140 | 5f5f | 374e | 4f62 | 6a65 | 6374 | 4650 | 6369 | 3a66 | 2830 | 2c32 | 3029 | 005f | 5f30 | 7468 | 6973 | 3a70 | 2830 | 2c38 | 3629 | 005f | 5f30 | 5f5f | 4133 | 303a |
| 2263220 | 7028 | 302c | 3230 | 2900 | 5f5f | 305f | 5f41 | 3331 | 3a70 | 2830 | 2c31 | 2900 | 5f5f | 3074 | 6869 | 7320 | 3a5a | 746c | 005f | 5f30 | 5f5f | 4133 | 3020 | 3a5a |
| 2263300 | 746c | 005f | 5f30 | 5f5f | 4133 | 3120 | 3a5a | 746c | 0067 | 6574 | 5072 | 6f70 | 5f5f | 374e | 4f62 | 6a65 | 6374 | 4650 | 6369 | 203a | 5a74 | 4600 | 6765 | 7441 |
| 2263360 | 7474 | 725f | 5f37 | 4e4f | 626a | 6563 | 7446 | 693a | 6628 | 302c | 3230 | 2900 | 5f5f | 3074 | 6869 | 733a | 7028 | 302c | 3836 | 2900 | 5f5f | 305f | 5f41 | 3239 |
| 2263440 | 3a70 | 2830 | 2c31 | 2900 | 5f5f | 3074 | 6869 | 7320 | 3a5a | 746c | 005f | 5f30 | 5f5f | 4132 | 3920 | 3a5a | 746c | 0067 | 6574 | 4174 | 7472 | 5f5f | 374e | 4f62 |
| 2263520 | 6a65 | 6374 | 4669 | 203a | 5a74 | 4600 | 696e | 4f72 | 6465 | 725f | 5f36 | 4f62 | 6a65 | 6374 | 4650 | 364f | 626a | 6563 | 743a | 6628 | 302c | 3129 | 005f | 5f30 |
| 2263600 | 7468 | 6973 | 3a70 | 2830 | 2c31 | 3038 | 2900 | 5f5f | 305f | 5f41 | 3237 | 3a70 | 2830 | 2c31 | 3038 | 2900 | 2f68 | 6f6d | 652f | 6f73 | 6173 | 312f | 612f | 6162 |
| 2263660 | 2f73 | 7263 | 2f6e | 6577 | 6f62 | 6a65 | 6374 | 732f | 6878 | 782f | 4f62 | 6a65 | 6374 | 5f64 | 622e | 6878 | 7800 | 5f5f | 3074 | 6869 | 7320 | 3a5a | 746c | 005f |
| 2263740 | 5f30 | 5f5f | 4132 | 3720 | 3a5a | 746c | 0069 | 6e4f | 7264 | 6572 | 5f5f | 364f | 626a | 6563 | 7446 | 5036 | 4f62 | 6a65 | 6374 | 203a | 5a74 | 4600 | 656e | 7469 |
| 2264020 | 7479 | 2e6f | 005f | 7365 | 7450 | 726f | 705f | 5f37 | 4e4f | 626a | 6563 | 7446 | 5063 | 6600 | 5f73 | 6574 | 5072 | 6f70 | 5f5f | 374e | 4f62 | 6a65 | 6374 | 4650 |
| 2264100 | 6369 | 005f | 6765 | 7441 | 7474 | 725f | 5f37 | 4e4f | 626a | 6563 | 7446 | 6900 | 5f70 | 7574 | 5f5f | 376f | 7374 | 7265 | 616d | 4663 | 005f | 7365 | 7450 | 726f |
| 2264160 | 705f | 5f37 | 4e4f | 626a | 6563 | 7446 | 5363 | 5431 | 005f | 696f | 7374 | 7265 | 616d | 5f69 | 6e69 | 7400 | 5f65 | 7870 | 6c61 | 696e | 5f5f | 384c | 504f | 626a |
| 2264240 | 6563 | 7446 | 5063 | 005f | 6765 | 7450 | 726f | 705f | 5f37 | 4e4f | 626a | 6563 | 7446 | 5063 | 6900 | 5f69 | 6e4f | 7264 | 6572 | 5f5f | 364f | 626a | 6563 | 7446 |
| 2264320 | 5036 | 4f62 | 6a65 | 6374 | 002f | 686f | 6d65 | 2f6f | 7361 | 7331 | 2f61 | 2f61 | 622f | 7372 | 632f | 6e65 | 776f | 626a | 6563 | 7473 | 2f70 | 726f | 672f | 432b |
| 2264400 | 2b2e | 3139 | 3132 | 312f | 0065 | 6e74 | 6974 | 792e | 6300 | 656e | 7469 | 7479 | 2e63 | 7878 | 0069 | 6e74 | 3a74 | 2830 | 2c31 | 293d | 7228 | 302c | 3129 | 3b2d |
| 2264460 | 3231 | 3437 | 3438 | 3336 | 3438 | 3b32 | 3134 | 3734 | 3833 | 3634 | 373b | 0063 | 6861 | 723a | 7428 | 302c | 3229 | 3d72 | 2830 | 2c32 | 293b | 303b | 3132 | 373b |
| 2264540 | 006c | 6f6e | 673a | 7428 | 302c | 3329 | 3d72 | 2830 | 2c31 | 293b | 2d32 | 3134 | 3734 | 3833 | 3634 | 383b | 3231 | 3437 | 3438 | 3336 | 3437 | 3b00 | 7368 | 6f72 |
| 2264620 | 743a | 7428 | 302c | 3429 | 3d72 | 2830 | 2c31 | 293b | 2d33 | 3237 | 3638 | 3b33 | 3237 | 3637 | 3b00 | 756e | 7369 | 676e | 6564 | 2063 | 6861 | 723a | 7428 | 302c |
| 2264700 | 3529 | 3d72 | 2830 | 2c31 | 293b | 303b | 3235 | 353b | 0075 | 6e73 | 6967 | 6e65 | 6420 | 7368 | 6f72 | 743a | 7428 | 302c | 3629 | 3d72 | 2830 | 2c31 | 293b | 303b |
| 2264760 | 3635 | 3533 | 353b | 0075 | 6e73 | 6967 | 6e65 | 6420 | 6c6f | 6e67 | 3a74 | 2830 | 2c37 | 293d | 7228 | 302c | 3129 | 3b30 | 3b2d | 313b | 0075 | 6e73 | 6967 | 6e65 |
| 2265040 | 6420 | 696e | 743a | 7428 | 302c | 3829 | 3d72 | 2830 | 2c31 | 293b | 303b | 2d31 | 3b00 | 666c | 6f61 | 743a | 7428 | 302c | 3929 | 3d72 | 2830 | 2c31 | 293b | 343b |
| 2265120 | 303b | 0064 | 6f75 | 626c | 653a | 7428 | 302c | 3130 | 293d | 7228 | 302c | 3129 | 3b38 | 3b30 | 3b00 | 766f | 6964 | 3a74 | 2830 | 2c31 | 3129 | 3d28 | 302c | 3131 |
| 2265200 | 2900 | 3f3f | 3f3a | 7428 | 302c | 3132 | 293d | 2830 | 2c31 | 2900 | 5f5f | 7670 | 7470 | 3a74 | 2830 | 2c31 | 3329 | 3d2a | 2830 | 2c31 | 3429 | 3d66 | 2830 | 2c31 |
| 2265260 | 2900 | 5f5f | 6d70 | 7472 | 3a54 | 2830 | 2c31 | 3529 | 3d73 | 3864 | 3a28 | 302c | 3429 | 2c30 | 2c31 | 363b | 693a | 2830 | 2c34 | 292c | 3136 | 2c31 | 363b | 663a |
| 2265340 | 2830 | 2c31 | 3329 | 2c33 | 322c | 3332 | 3b3b | 005f | 5046 | 565f | 3a74 | 2830 | 2c31 | 3629 | 3d2a | 2830 | 2c31 | 3729 | 3d66 | 2830 | 2c32 | 2900 | 5f50 | 4649 |
| 2265420 | 5f3a | 7428 | 302c | 3133 | 2900 | 7374 | 7265 | 616d | 706f | 733a | 7428 | 302c | 3129 | 0073 | 7472 | 6561 | 6d6f | 6666 | 3a74 | 2830 | 2c31 | 2900 | 696f | 5f73 |
| 2265500 | 7461 | 7465 | 3a54 | 2830 | 2c31 | 3829 | 3165 | 676f | 6f64 | 6269 | 745f | 5f69 | 6f5f | 7374 | 6174 | 653a | 302c | 656f | 6662 | 6974 | 5f5f | 696f | 5f73 | 7461 |
| 2265560 | 7465 | 3a31 | 2c66 | 6169 | 6c62 | 6974 | 5f5f | 696f | 5f73 | 7461 | 7465 | 3a32 | 2c62 | 6164 | 6269 | 745f | 5f69 | 6f5f | 7374 | 6174 | 653a | 332c | 6861 | 7264 |
| 2265640 | 6661 | 696c | 5f5f | 696f | 5f73 | 7461 | 7465 | 3a34 | 2c3b | 006f | 7065 | 6e5f | 6d6f | 6465 | 3a54 | 2830 | 2c31 | 3929 | 3d65 | 696e | 5f5f | 6f70 | 656e | 5f6d |
| 2265720 | 6f64 | 653a | 302c | 6f75 | 745f | 5f6f | 7065 | 6e5f | 6d6f | 6465 | 3a31 | 2c61 | 7465 | 5f5f | 6f70 | 656e | 5f6d | 6f64 | 653a | 322c | 6170 | 705f | 5f6f | 7065 |
| 2266000 | 6e5f | 6d6f | 6465 | 3a33 | 2c74 | 7275 | 6e63 | 5f5f | 6f70 | 656e | 5f6d | 6f64 | 653a | 342c | 6e6f | 6372 | 6561 | 7465 | 5f5f | 6f70 | 656e | 5f6d | 6f64 | 653a |
| 2266060 | 352c | 6e6f | 7265 | 706c | 6163 | 655f | 5f6f | 7065 | 6e5f | 6d6f | 6465 | 3a36 | 2c3b | 0073 | 6565 | 6b5f | 6469 | 723a | 5428 | 302c | 3230 | 293d | 6562 | 6567 |
| 2266140 | 5f5f | 7365 | 656b | 5f64 | 6972 | 3a30 | 2c63 | 7572 | 5f5f | 7365 | 656b | 5f64 | 6972 | 3a31 | 2c65 | 6e64 | 5f5f | 7365 | 656b | 5f64 | 6972 | 3a32 | 2c3b | 005f |
| 2266220 | 5f45 | 313a | 5428 | 302c | 3231 | 293d | 6573 | 6b69 | 7077 | 735f | 5f5f | 5f45 | 313a | 302c | 6c65 | 6674 | 5f5f | 5f5f | 4531 | 3a31 | 2c72 | 6967 | 6874 | 5f5f |
| 2266300 | 5f5f | 4531 | 3a32 | 2c69 | 6e74 | 6572 | 6e61 | 6c5f | 5f5f | 5f45 | 313a | 332c | 6465 | 635f | 5f5f | 5f45 | 313a | 342c | 6f63 | 745f | 5f5f | 5f45 | 313a | 352c |

| | | | | | | | | | | | | | | | | | | | | | | | | |
|---|---|---|---|---|---|---|---|---|---|---|---|---|---|---|---|---|---|---|---|---|---|---|---|---|
| 2266360 | 6865 | 785f | 5f5f | 5f45 | 313a | 362c | 7368 | 6f77 | 6261 | 7365 | 5f5f | 5f5f | 4531 | 3a37 | 2c5c | 0073 | 686f | 7770 | 6f69 | 6e74 | 5f5f | 5f5f | 4531 | 3a38 |
| 2266440 | 2c75 | 7070 | 6572 | 6361 | 7365 | 5f5f | 5f5f | 4531 | 3a39 | 2c73 | 686f | 7770 | 6f73 | 5f5f | 5f5f | 4531 | 3a31 | 302c | 7363 | 6965 | 6e74 | 6966 | 6963 | 5f5f |
| 2266520 | 5f5f | 4531 | 3a31 | 312c | 6669 | 7865 | 645f | 5f5f | 5f45 | 313a | 3132 | 2c75 | 6e69 | 7462 | 7566 | 5f5f | 5f5f | 4531 | 3a31 | 332c | 7374 | 6469 | 6f5f | 5f5f |
| 2266600 | 5f45 | 313a | 3134 | 2c3b | 005f | 5f45 | 323a | 5428 | 302c | 3232 | 293d | 6573 | 6b69 | 7070 | 696e | 675f | 5f5f | 5f45 | 323a | 302c | 7469 | 6564 | 5f5f | 5f5f |
| 2266660 | 4532 | 3a31 | 2c3b | 0069 | 6f73 | 3a54 | 2830 | 2c32 | 3329 | 3d73 | 3630 | 6e75 | 7365 | 725f | 5f33 | 696f | 733a | 2830 | 2c31 | 292c | 302c | 3332 | 3b78 | 5f75 |
| 2266740 | 7365 | 725f | 5f33 | 696f | 733a | 2830 | 2c32 | 3729 | 3d2a | 2830 | 2c32 | 3429 | 3d78 | 7569 | 6f73 | 5f75 | 7365 | 725f | 756e | 696f | 6e3a | 2c33 | 322c | 3332 |
| 2267020 | 3b62 | 705f | 5f33 | 696f | 733a | 2830 | 2c32 | 3829 | 3d2a | 2830 | 2c32 | 3529 | 3d78 | 7373 | 7472 | 6561 | 6d62 | 7566 | 3a2c | 3634 | 2c33 | 323b | 7374 | 6174 |
| 2267100 | 655f | 5f33 | 696f | 733a | 2830 | 2c31 | 292c | 3936 | 2c33 | 323b | 6973 | 7065 | 6369 | 616c | 5f5f | 3369 | 6f73 | 3a28 | 302c | 3129 | 2c31 | 3238 | 2c33 | 323b |
| 2267160 | 6f73 | 7065 | 6369 | 616c | 5f5f | 3369 | 6f73 | 3a28 | 302c | 3129 | 2c31 | 3630 | 2c33 | 323b | 6973 | 6678 | 5f73 | 7065 | 6369 | 616c | 5f5f | 3369 | 6f73 | 3a28 |
| 2267240 | 302c | 3129 | 2c31 | 3932 | 2c33 | 323b | 6f73 | 6678 | 5f73 | 7065 | 6369 | 616c | 5f5f | 3369 | 6f73 | 3a28 | 302c | 3129 | 2c32 | 3234 | 2c33 | 323b | 5c00 | 6465 |
| 2267320 | 6c62 | 7566 | 5f5f | 3369 | 6f73 | 3a28 | 302c | 3129 | 2c32 | 3536 | 2c33 | 323b | 785f | 7469 | 655f | 5f33 | 696f | 733a | 2830 | 2c32 | 3929 | 3d2a | 2830 | 2c32 |
| 2267400 | 3629 | 3d78 | 736f | 7374 | 7265 | 616d | 3a2c | 3238 | 382c | 3332 | 3b78 | 5f66 | 6c61 | 6773 | 5f5f | 3369 | 6f73 | 3a28 | 302c | 3129 | 2c33 | 3230 | 2c33 | 323b |
| 2267460 | 785f | 7072 | 6563 | 6973 | 696f | 6e5f | 5f33 | 696f | 733a | 2830 | 2c34 | 292c | 3335 | 322c | 3136 | 3b78 | 5f66 | 696c | 6c5f | 5f33 | 696f | 733a | 2830 | 2c32 |
| 2267540 | 292c | 3336 | 382c | 383b | 785f | 7769 | 6474 | 685f | 5f33 | 696f | 733a | 2830 | 2c34 | 292c | 3338 | 342c | 3136 | 3b61 | 7373 | 6967 | 6e5f | 7072 | 6976 | 6174 |
| 2267620 | 655f | 5f33 | 696f | 733a | 2830 | 2c31 | 292c | 3431 | 362c | 3332 | 3b5f | 5f76 | 7074 | 725f | 5f33 | 696f | 733a | 2830 | 2c33 | 3029 | 3d2a | 2830 | 2c31 | 3529 |
| 2267700 | 2c34 | 3438 | 2c33 | 323b | 3b00 | 6261 | 7365 | 6669 | 656c | 645f | 5f33 | 696f | 733a | 4728 | 302c | 3129 | 0061 | 646a | 7573 | 7466 | 6965 | 6c64 | 5f5f | 3369 |
| 2267760 | 6f73 | 3a47 | 2830 | 2c31 | 2900 | 666c | 6f61 | 7466 | 6965 | 6c64 | 5f5f | 3369 | 6f73 | 3a47 | 2830 | 2c31 | 2900 | 6e65 | 7874 | 6269 | 745f | 5f33 | 696f | 733a |
| 2270040 | 4728 | 302c | 3129 | 006e | 6578 | 7477 | 6f72 | 645f | 5f33 | 696f | 733a | 4728 | 302c | 3129 | 0073 | 7464 | 696f | 666c | 7573 | 685f | 5f33 | 696f | 733a | 4728 |
| 2270120 | 302c | 3136 | 2900 | 696f | 733a | 5a63 | 696f | 733b | 3b5f | 5f63 | 745f | 5f33 | 696f | 7346 | 5039 | 7374 | 7265 | 616d | 6275 | 6620 | 5f5f | 6374 | 5f5f | 3369 |
| 2270200 | 6f73 | 4676 | 205f | 5f63 | 745f | 5f33 | 696f | 7346 | 5233 | 696f | 7320 | 5f5f | 6474 | 5f5f | 3369 | 6f73 | 4676 | 2066 | 6c61 | 6773 | 5f5f | 3369 | 6f73 | 4676 |
| 2270260 | 2066 | 6c61 | 6773 | 5f5f | 3369 | 6f73 | 466c | 2073 | 6574 | 665f | 5f33 | 696f | 7346 | 6c54 | 3120 | 7365 | 7466 | 5f5f | 3369 | 6f73 | 466c | 2075 | 6e73 | 6574 |
| 2270340 | 665f | 5f33 | 696f | 7346 | 6c20 | 7769 | 6474 | 685f | 5f33 | 696f | 7346 | 7620 | 7769 | 6474 | 685f | 5f33 | 696f | 7346 | 6920 | 7469 | 655f | 5f33 | 696f | 7346 |
| 2270420 | 5037 | 6f73 | 7472 | 6561 | 6d20 | 5c00 | 7469 | 655f | 5f33 | 696f | 7346 | 7620 | 6669 | 6c6c | 5f5f | 3369 | 6f73 | 4663 | 2066 | 696c | 6c5f | 5f33 | 696f | 7346 |
| 2270500 | 7620 | 7072 | 6563 | 6973 | 696f | 6e5f | 5f33 | 696f | 7346 | 6920 | 7072 | 6563 | 6973 | 696f | 6e5f | 5f33 | 696f | 7346 | 7620 | 7264 | 7374 | 6174 | 655f | 5f33 |
| 2270560 | 696f | 7346 | 7620 | 5f5f | 6f70 | 5076 | 5f5f | 3369 | 6f73 | 4676 | 205f | 5f6e | 745f | 5f33 | 696f | 7346 | 7620 | 656f | 665f | 5f33 | 696f | 7346 | 7620 | 6661 |
| 2270640 | 696c | 5f5f | 3369 | 6f73 | 4676 | 2062 | 6164 | 5f5f | 3369 | 6f73 | 4676 | 2067 | 6f6f | 645f | 5f33 | 696f | 7346 | 7620 | 636c | 6561 | 725f | 5f33 | 696f | 7346 |
| 2270720 | 6920 | 7264 | 6275 | 665f | 5f33 | 696f | 7346 | 7620 | 5c00 | 6977 | 6f72 | 645f | 5f33 | 696f | 7346 | 6920 | 7077 | 6f72 | 645f | 5f33 | 696f | 7346 | 6920 | 6269 |
| 2271000 | 7461 | 6c6c | 6f63 | 5f5f | 3369 | 6f73 | 5346 | 7620 | 7961 | 6c6c | 6f63 | 5f5f | 3369 | 6f73 | 5346 | 7620 | 7572 | 6573 | 697a | 655f | 5f33 | 696f | 7346 | 6920 |
| 2271060 | 7379 | 6e63 | 5f77 | 6974 | 685f | 7374 | 6469 | 6f5f | 5f33 | 696f | 7353 | 4676 | 2073 | 6574 | 7374 | 6174 | 655f | 5f33 | 696f | 7346 | 6920 | 696e | 6974 | 5f5f |
| 2271140 | 3369 | 6f73 | 4650 | 3973 | 7472 | 6561 | 6162 | 7566 | 205f | 5f61 | 735f | 5f33 | 696f | 7346 | 5233 | 696f | 7320 | 736b | 6970 | 5f5f | 3369 | 6f73 | 4669 | 203b |
| 2271220 | 6261 | 7365 | 6669 | 656c | 645f | 5f33 | 696f | 7320 | 5c00 | 6164 | 6a75 | 7374 | 6669 | 656c | 645f | 5f33 | 696f | 7320 | 666c | 6f61 | 7466 | 6965 | 6c64 | 5f5f |
| 2271300 | 3369 | 6f73 | 206e | 6578 | 7462 | 6974 | 5f5f | 3369 | 6f73 | 206e | 6578 | 7477 | 6f72 | 645f | 5f33 | 696f | 7320 | 7374 | 6469 | 6f66 | 6c75 | 7368 | 5f5f | 3369 |
| 2271360 | 6f73 | 203b | 3b00 | 7374 | 7265 | 616d | 6275 | 663a | 5428 | 302c | 3235 | 293d | 7334 | 3061 | 6c6c | 6f63 | 5f5f | 3973 | 7472 | 6561 | 6d62 | 7566 | 3a28 | 302c |
| 2271440 | 3429 | 2c30 | 2c31 | 363b | 785f | 756e | 6275 | 665f | 5f39 | 7374 | 7265 | 616d | 6275 | 663a | 2830 | 2c34 | 292c | 3136 | 2c31 | 363b | 785f | 6261 | 7365 | 5f5f |
| 2271520 | 3973 | 7472 | 6561 | 6162 | 7566 | 3a28 | 302c | 3331 | 293d | 2a28 | 302c | 3229 | 2c33 | 322c | 3332 | 3b78 | 5f70 | 6261 | 7365 | 5f5f | 3973 | 7472 | 6561 | 6d62 |
| 2271600 | 7566 | 3a28 | 302c | 3331 | 292c | 3634 | 2c33 | 323b | 785f | 7070 | 7472 | 5f5f | 3973 | 7472 | 6561 | 6d62 | 7566 | 3a28 | 302c | 3331 | 292c | 3936 | 2c33 | 323b |
| 2271660 | 785f | 6570 | 7074 | 725f | 5f39 | 7374 | 7265 | 616d | 6275 | 663a | 2830 | 2c33 | 3129 | 2c31 | 3238 | 2c33 | 323b | 785f | 6770 | 7472 | 5f5f | 3973 | 7472 | 6561 |
| 2271740 | 6d62 | 7566 | 3a28 | 302c | 3331 | 292c | 3136 | 302c | 3332 | 3b78 | 5f65 | 6770 | 7472 | 5f5f | 3973 | 7472 | 6561 | 6d62 | 7566 | 3a28 | 302c | 3331 | 292c | 3139 |
| 2272020 | 322c | 3332 | 3b5c | 0078 | 5f65 | 6261 | 636b | 5f5f | 3973 | 7472 | 6561 | 6d62 | 7566 | 3a28 | 302c | 3331 | 292c | 3232 | 342c | 3332 | 3b78 | 5f62 | 6c65 | 6e5f |
| 2272100 | 5f39 | 7374 | 7265 | 616d | 6275 | 663a | 2830 | 2c31 | 292c | 3235 | 362c | 3332 | 3b5f | 5f76 | 7074 | 725f | 5f39 | 7374 | 7265 | 616d | 6275 | 663a | 2830 | 2c33 |
| 2272160 | 3029 | 2c32 | 3038 | 2c33 | 323b | 3b00 | 7374 | 7265 | 616d | 6275 | 663a | 5a63 | 7374 | 7265 | 616d | 6275 | 663b | 3b5f | 5f63 | 745f | 5f39 | 7374 | 7265 | 616d |
| 2272240 | 6275 | 6646 | 5239 | 7374 | 7265 | 616d | 6275 | 6620 | 5f5f | 6374 | 5f5f | 3973 | 7472 | 6561 | 6d62 | 7566 | 4676 | 205f | 5f63 | 745f | 5f39 | 7374 | 7265 | 616d |
| 2272320 | 6275 | 6646 | 5063 | 6920 | 5f5f | 6374 | 5f5f | 3973 | 7472 | 6561 | 6d62 | 7566 | 4650 | 6369 | 5432 | 205f | 5f61 | 735f | 5f39 | 7374 | 7265 | 616d | 6275 | 6646 |
| 2272400 | 5239 | 7374 | 7265 | 616d | 6275 | 6620 | 6462 | 705f | 5f39 | 7374 | 7265 | 616d | 6275 | 6646 | 7620 | 6261 | 7365 | 5f5f | 3973 | 7472 | 6561 | 6d62 | 7566 | 4676 |
| 2272460 | 2070 | 6261 | 7365 | 5f5f | 3973 | 7472 | 6561 | 6d62 | 7566 | 4676 | 205c | 0070 | 7074 | 725f | 5f39 | 7374 | 7265 | 616d | 6275 | 6646 | 7620 | 6570 | 7074 | 725f |
| 2272540 | 5f39 | 7374 | 7265 | 616d | 6275 | 6646 | 7620 | 6770 | 7472 | 5f5f | 3973 | 7472 | 6561 | 6d62 | 7566 | 4676 | 2065 | 6770 | 7472 | 5f5f | 3973 | 7472 | 6561 | 6d62 |
| 2272620 | 7566 | 4676 | 2065 | 6261 | 636b | 5f5f | 3973 | 7472 | 6561 | 6d62 | 7566 | 4676 | 2065 | 6275 | 665f | 5f39 | 7374 | 7265 | 616d | 6275 | 6646 | 7620 | 626c | 656e |
| 2272700 | 5f5f | 3973 | 7472 | 6561 | 6d62 | 7566 | 4676 | 2073 | 6574 | 705f | 5f39 | 7374 | 7265 | 616d | 6275 | 6646 | 5063 | 5431 | 2073 | 6574 | 675f | 5f39 | 7374 | 7265 |
| 2272760 | 616d | 6275 | 6646 | 5063 | 4e32 | 3120 | 7062 | 756d | 705f | 5f39 | 7374 | 7265 | 616d | 6275 | 6646 | 6920 | 5c00 | 6762 | 756d | 705f | 5f39 | 7374 | 7265 | 616d |
| 2273040 | 6275 | 6646 | 6920 | 7365 | 7462 | 5f5f | 3973 | 7472 | 6561 | 6d62 | 7566 | 4650 | 6354 | 3169 | 2075 | 6e62 | 7566 | 6665 | 7265 | 645f | 5f39 | 7374 | 7265 | 616d |
| 2273120 | 6275 | 6646 | 7620 | 756e | 6275 | 6665 | 6572 | 6564 | 5f5f | 3973 | 7472 | 6561 | 6d62 | 7566 | 4669 | 2061 | 6c6c | 6f63 | 6174 | 655f | 5f39 | 7374 | 7265 | 616d |
| 2273200 | 6275 | 6646 | 7620 | 646f | 616c | 6c6f | 6361 | 7465 | 5f5f | 3973 | 7472 | 6561 | 6d62 | 7566 | 4676 | 206f | 7665 | 7266 | 6c6f | 775f | 5f39 | 7374 | 7265 | 616d |
| 2273260 | 6275 | 6646 | 6920 | 756e | 6465 | 7266 | 6c6f | 775f | 5f39 | 7374 | 7265 | 616d | 6275 | 6646 | 7620 | 5c00 | 7062 | 6163 | 6b66 | 6169 | 6c5f | 5f39 | 7374 | 7265 |
| 2273340 | 616d | 6275 | 6646 | 6920 | 7379 | 6e63 | 5f5f | 3973 | 7472 | 6561 | 6d62 | 7566 | 4676 | 2073 | 6565 | 6b6f | 6666 | 5f5f | 3973 | 7472 | 6561 | 6d62 | 7566 | 466c |
| 2273420 | 3873 | 6565 | 6b5f | 6469 | 7269 | 2073 | 6565 | 6b70 | 6f73 | 5f5f | 3973 | 7472 | 6561 | 6162 | 7566 | 466c | 6920 | 7873 | 7075 | 746e | 5f5f | 3973 | 7472 | 6561 |

```
2273500 6d62 7566 4650 4363 6920 7873 6765 746e 5f5f 3973 7472 6561 6d62 7566 4650 6369 2069 6e5f 6176 6169 6c5f 5f39 7374 7265
2273560 616d 6275 6646 7620 6f75 745f 7761 6974 696e 675f 5f39 7374 7265 616d 6275 6646 7620 5c00 7367 6574 635f 5f39 7374 7265
2273640 616d 6275 6646 7620 736e 6578 7463 5f5f 3973 7472 6561 6d62 7566 4676 2073 6275 6d70 635f 5f39 7374 7265 616d 6275 6646
2273720 7620 7374 6f73 7363 5f5f 3973 7472 6561 6d62 7566 4676 2073 7075 7462 6163 6b63 5f5f 3973 7472 6561 6d62 7566 4663 2073
2274000 7075 7463 5f5f 3973 7472 6561 6d62 7566 4669 2073 7075 746e 5f5f 3973 7472 6561 6d62 7566 4650 4363 6920 7367 6574 6e5f
2274060 5f39 7374 7265 616d 6275 6646 5063 6920 7365 7462 7566 5f5f 3973 7472 6561 6d62 7566 4650 6369 205c 0073 6574 6275 665f
2274140 5f39 7374 7265 616d 6275 6646 5055 6369 2073 6574 6275 665f 5f39 7374 7265 616d 6275 6646 5063 6954 3220 5f5f 6474 5f5f
2274220 3973 7472 6561 6d62 7566 4676 2078 5f73 6e65 7974 635f 5f39 7374 7265 616d 6275 6646 7620 3b3b 3b00 6973 7472 6561 6d3a
2274300 5428 302c 3332 293d 7337 3278 5f67 636f 756e 745f 5f37 6973 7472 6561 6d3a 2830 2c31 292c 302c 3332 3b5f 5f76 7074 725f
2274360 5f37 6973 7472 6561 6d3a 2830 2c33 3029 2c33 322c 3332 3b50 696f 733a 2830 2c33 3329 3d2a 2830 2c32 3329 2c36 342c 3332
2274440 3b4f 696f 733a 2830 2c32 3329 2c39 362c 3438 303b 3b00 6973 7472 6561 6d3a 5a63 6973 7472 6561 633b 696f 733b 5f5f 6374
2274520 5f5f 3769 7374 7265 616d 4650 3973 7472 6561 6d62 7566 205f 5f63 745f 5f37 6973 7472 6561 6d46 7620 5f5f 6374 5f5f 3769
2274600 7374 7265 616d 4650 3973 7472 6561 6d62 7566 6950 376f 7374 7265 616d 205f 5f63 745f 5f37 6973 7472 6561 6d46 6950 6354
2274660 3120 5f5f 6374 5f5f 3769 7374 7265 616d 4669 5431 5037 6f73 7472 6561 6d20 5f5f 6374 5f5f 3769 7374 7265 616d 4652 3769
2274740 7374 7265 616d 205f 5f64 745f 5f37 6973 7472 6561 6d46 7620 5c00 6970 6678 5f5f 3769 7374 7265 616d 4669 2069 7366 785f
2275020 5f37 6973 7472 6561 6d46 7620 7365 656b 675f 5f37 6973 7472 6561 6d46 6c20 7365 656b 675f 5f37 6973 7472 6561 6d46 6c38
2275100 7365 656b 5f64 6972 2074 656c 6c67 5f5f 3769 7374 7265 616d 4676 205f 5f72 735f 5f37 6973 7472 6561 6d46 5046 5237 6973
2275160 7472 6561 6d5f 5237 6973 7472 6561 6d20 5f5f 7273 5f5f 3769 7374 7265 616d 4650 4652 3369 6f73 5f52 3369 6f73 205f 5f72
2275240 735f 5f37 6973 7472 6561 6d46 5063 205f 5f72 735f 5f37 6973 7472 6561 6d46 5055 6320 5c00 5f5f 7273 5f5f 3769 7374 7265
2275320 616d 4652 5563 205f 5f72 735f 5f37 6973 7472 6561 6d46 5263 205f 5f72 735f 5f37 6973 7472 6561 6d46 5273 205f 5f72 735f
2275400 5f37 6973 7472 6561 6d46 5269 205f 5f72 735f 5f37 6973 7472 6561 6d46 526c 205f 5f72 735f 5f37 6973 7472 6561 6d46 5255
2275460 7320 5f5f 7273 5f5f 3769 7374 7265 616d 4652 5569 205f 5f72 735f 5f37 6973 7472 6561 6d46 5255 6c20 5f5f 7273 5f5f 3769
2275540 7374 7265 616d 4652 6620 5f5f 7273 5f5f 3769 7374 7265 616d 4652 6420 5f5f 7273 5f5f 3769 7374 7265 616d 4650 3973 7472
2275620 6561 6d62 7566 205c 0067 6574 5f5f 3769 7374 7265 616d 4650 6369 6320 6765 745f 5f37 6973 7472 6551 6d46 5055 6369 6320
2275700 6765 745f 5f37 6973 7472 6561 6d46 5239 7374 7265 616d 6275 6663 2067 6574 5f5f 3769 7374 7265 616d 4652 5563 2067 6574
2275760 5f5f 3769 7374 7265 616d 4652 6320 6765 745f 5f37 6973 7472 6561 6d46 7620 6765 746c 696e 655f 5f37 6973 7472 6561 6d46
2276040 5063 6963 2067 6574 6c69 6e65 5f5f 3769 7374 7265 616d 4650 5563 6963 2070 6565 6b5f 5f37 6973 7472 6561 6d46 7620 6967
2276120 6e6f 7265 5f5f 3769 7374 7265 616d 4669 5431 205c 0072 6561 645f 5f37 6973 7472 6561 6d46 5063 6920 7265 6164 5f5f 3769
2276200 7374 7265 616d 4650 5563 6920 6763 6f75 6e74 5f5f 3769 7374 7265 616d 4676 2070 7574 6261 636b 5f5f 3769 7374 7265 616d
2276260 4663 2073 796e 635f 5f37 6973 7472 6561 6d46 7620 646f 5f69 7066 785f 5f37 6973 7472 6561 6d46 6920 6561 7477 6869 7465
2276340 5f5f 3769 7374 7265 616d 4676 2078 6765 745f 5f37 6973 7472 6561 6d46 5063 203b 3b3b 006f 7374 7265 616d 3a54 2830 2c32
2276420 3629 3d73 3638 5f5f 7670 7472 5f5f 376f 7374 7265 616d 3a28 302c 3330 292c 302c 3332 3b50 696f 733a 2830 2c33 3329 2c33
2276500 322c 3332 3b4f 696f 733a 2830 2c32 3329 2c36 342c 3438 303b 3b00 6f73 7472 6561 6d3a 5a63 6f73 7472 6561 6d3b 696f 733b
2276560 5f5f 6374 5f5f 376f 7374 7265 616d 4650 3973 7472 6561 6d62 7566 205f 5f63 745f 5f37 6f73 7472 6561 6d46 7620 5f5f 6374
2276640 5f5f 376f 7374 7265 616d 4669 205f 5f63 745f 5f37 6f73 7472 6561 6d46 6950 6320 5f5f 6374 5f5f 376f 7374 7265 616d 4652
2276720 376f 7374 7265 616d 205f 5f64 745f 5f37 6f73 7472 6561 6d46 7620 6f70 6678 5f5f 376f 7374 7265 616d 4676 206f 7366 785f
2277000 5f37 6f73 7472 6561 6d46 7620 666c 7573 685f 5f37 6f73 7472 6561 6d46 7620 5c00 7365 656b 705f 5f37 6f73 7472 6561 6d46
2277060 6c20 7365 656b 705f 5f37 6f73 7472 6561 6d46 6c38 7365 656b 5f64 6972 2074 656c 6c70 5f5f 376f 7374 7265 616d 4676 2070
2277140 7574 5f5f 376f 7374 7265 616d 4663 205f 5f6c 735f 5f37 6f73 7472 6561 6d46 6320 5f5f 6c73 5f5f 376f 7374 7265 616d 4655
2277220 6320 5f5f 6c73 5f5f 376f 7374 7265 616d 4650 4363 205f 5f6c 735f 5f37 6f73 7472 6561 6d46 6920 5f5f 6c73 5f5f 376f 7374
2277300 7265 616d 466c 205f 5f6c 735f 5f37 6f73 7472 6561 6d46 6420 5f5f 6c73 5f5f 376f 7374 7265 616d 4666 205c 005f 5f6c 735f
2277360 5f37 6f73 7472 6561 6d46 5569 205f 5f6c 735f 5f37 6f73 7472 6561 6d46 556c 205f 5f6c 735f 5f37 6f73 7472 6561 6d46 5076
2277440 205f 5f6c 735f 5f37 6f73 7472 6561 6d46 5039 7374 7265 616d 6275 6620 5f5f 6c73 5f5f 376f 7374 7265 616d 4673 205f 5f6c
2277520 735f 5f37 6f73 7472 6561 6d46 5573 205f 5f6c 735f 5f37 6f73 7472 6561 6d46 5046 5237 6f73 7472 6561 6d5f 5237 6f73 7472
2277600 6561 6d20 5f5f 6c73 5f5f 376f 7374 7265 616d 4650 4652 3369 6f73 5f52 3369 6f73 2077 7269 7465 5f5f 376f 7374 7265 616d
2277660 4650 4363 6920 5c00 7772 6974 655f 5f37 6f73 7472 6561 6d46 5043 5563 6920 646f 5f6f 7066 785f 5f37 6f73 7472 6561 6d46
2277740 7620 646f 5f6f 7366 785f 5f37 6f73 7472 6561 6d46 7620 3b3b 3b00 7075 745f 5f37 6f73 7472 6561 6d46 633a 6628 302c 3334
2300020 293d 2a28 302c 3236 2900 5f5f 3074 6869 733a 7028 302c 3334 2900 5f5f 3063 3a70 2830 2c32 2900 2f75 7372 2f43 432f 7375
2300100 6e34 2f69 6e63 6c2f 696f 7374 7265 616d 2e68 005f 5f30 7468 6973 3a72 2830 2c33 3429 005f 5f30 7468 6973 203a 5a74 6c00
2300160 5f5f 3063 203a 5a74 6c00 7075 745f 5f37 6f73 7472 6561 6d46 6320 3a5a 7446 0069 6f73 7472 6561 6d3a 5428 302c 3335 293d
2300240 7338 3078 5f67 636f 756e 745f 5f37 6973 7472 6561 6d3a 2830 2c31 292c 302c 3332 3b5f 5f76 7074 725f 5f37 6973 7472 6561
2300320 6d3a 2830 2c33 3029 2c33 322c 3332 3b50 696f 733a 2830 2c33 3329 2c36 342c 3332 3b4f 6f73 7472 6561 6d3a 2830 2c32 3629
2300400 2c39 362c 3534 343b 3b00 696f 7374 7265 616d 3a5a 6369 6f73 7472 6561 6d3b 6973 7472 6561 6d20 6f73 7472 6561 6d20 696f
2300460 733b 5f5f 6374 5f5f 3869 6f73 7472 6561 6d46 5039 7374 7265 616d 6275 6620 5f5f 6374 5f5f 3869 6f73 7472 6561 6d46 7620
2300540 5f5f 6374 5f5f 3869 6f73 7472 6561 6d46 5238 696f 7374 7265 616d 205f 5f64 745f 5f38 696f 7374 7265 616d 4676 203b 3b3b
```

```
2300620 0063 696e 3a47 2830 2c33 3629 3d78 7369 7374 7265 616d 5f77 6974 6861 7373 6967 6e3a 0063 6f75 743a 4728 302c 3337 293d
2300700 7873 6f73 7472 6561 6d5f 7769 7468 6173 7369 676e 3a00 6365 7272 3a47 2830 2c33 3729 0063 6c6f 673a 4728 302c 3337 2900
2300760 496f 7374 7265 616d 5f69 6e69 743a 5428 302c 3338 293d 7331 5f5f 5739 5f5f 3133 496f 7374 7265 616d 5f69 6e69 743a 2830
2301040 2c32 292c 302c 383b 3b00 7374 6473 7461 7475 735f 5f31 3349 6f73 7472 6561 6d5f 696e 6974 3a47 2830 2c31 2900 696e 6974
2301120 636f 756e 745f 5f31 3349 6f73 7472 6561 6d5f 696e 6974 3a47 2830 2c31 2900 496f 7374 7265 616d 5f69 6e69 743a 5a63 496f
2301200 7374 7265 616d 5f69 6e69 743b 3b5f 5f63 745f 5f31 3349 6f73 7472 6561 6d5f 696e 6974 4676 205f 5f64 745f 5f31 3349 6f73
2301260 7472 6561 6d5f 696e 6974 4676 203b 7374 6473 7461 7475 735f 5f31 3349 6f73 7472 6561 6d5f 696e 6974 2069 6e69 7463 6f75
2301340 6e74 5f5f 3133 496f 7374 7265 616d 5f69 6e69 7420 3b40 696f 733b 0069 6f73 7472 6561 6d5f 696e 6974 3a53 2830 2c33 3829
2301420 0047 5054 3a74 2830 2c31 3329 0073 6d61 6e69 705f 696e 743a 5428 302c 3339 293d 7338 6663 745f 5f31 3073 6d61 6e69 705f
2301500 696e 743a 2830 2c34 3929 3d2a 2830 2c34 3129 3d66 2830 2c33 3329 2c30 2c33 323b 6172 675f 5f31 3073 6d61 6e69 705f 696e
2301560 743a 2830 2c31 292c 3332 2c33 323b 3b00 736d 616e 6970 5f69 6e74 3a5a 6373 6d61 6e69 705f 696e 743b 3b5f 5f63 745f 5f31
2301640 3073 6d61 6e69 705f 696e 7446 5046 5233 696f 7369 5f52 3369 6f73 6920 3b3b 5f5f 6c73 5f5f 4652 376f 7374 7265 616d 5231
2301720 3073 6d61 6e69 705f 696e 7420 5f5f 7273 5f5f 4652 3769 7374 7265 616d 5231 3073 6d61 6e69 705f 696e 7420 3b00 7361 7070
2302000 6c79 5f69 6e74 3a54 2830 2c34 3229 3d73 3466 6374 5f5f 3130 7361 7070 6c79 5f69 6e74 3a28 302c 3430 292c 302c 3332 3b3b
2302060 0073 6170 706c 795f 696e 743a 5a63 7361 7070 6c79 5f69 6e74 3b3b 5f5f 6374 5f5f 3130 7361 7070 6c79 5f69 6e74 4650 4652
2302140 3369 6f73 695f 5233 696f 7320 5f5f 636c 5f5f 3130 7361 7070 6c79 5f69 6e74 4669 203b 3b3b 0069 6d61 6e69 705f 696e 743a
2302220 5428 302c 3433 293d 7338 6663 745f 5f31 3069 6d61 6e69 705f 696e 743a 2830 2c34 3429 3d2a 2830 2c34 3529 3d66 2830 2c34
2302300 3629 3d2a 2830 2c33 3229 2c30 2c33 323b 6172 675f 5f31 3069 6d61 6e69 705f 696e 743a 2830 2c31 292c 3332 2c33 323b 3b00
2302360 696d 616e 6970 5f69 6e74 3a5a 6369 6d61 6e69 705f 696e 743b 3b5f 5f63 745f 5f31 3069 6d61 6e69 705f 696e 7446 5046 5237
2302440 6973 7472 6561 6369 5f52 3769 7374 7265 616d 6920 3b3b 5f5f 7273 5f5f 4652 3769 7374 7265 616d 5231 3069 6d61 6e69 705f
2302520 696e 7420 3b00 6961 7070 6c79 5f69 6e74 3a54 2830 2c34 3729 3d73 3466 6374 5f5f 3130 6961 7070 6c79 5f69 6e74 3a28 302c
2302600 3434 292c 302c 3332 3b3b 0069 6170 706c 795f 696e 743a 5a63 6961 7070 6c79 5f69 6e74 3b3b 5f5f 6374 5f5f 3130 6961 7070
2302660 6c79 5f69 6e74 4650 4652 3769 7374 7265 616d 695f 5237 6973 7472 6561 6d20 5f5f 636c 5f5f 3130 6961 7070 6c79 5f69 6e74
2302740 4669 203b 3b3b 006f 6d61 6e69 705f 696e 743a 5428 302c 3438 293d 7338 6663 745f 5f31 306f 6d61 6e69 705f 696e 743a 2830
2303020 2c34 3929 3d2a 2830 2c35 3029 3d66 2830 2c33 3429 2c30 2c33 323b 6172 675f 5f31 306f 6d61 6e69 705f 696e 743a 2830 2c31
2303100 292c 3332 2c33 323b 3b00 6f6d 616e 6970 5f69 6e74 3a5a 636f 6d61 6e69 705f 696e 743b 3b5f 5f63 745f 5f31 306f 6d61 6e69
2303160 705f 696e 7446 5046 5237 6f73 7472 6561 6d69 5f52 376f 7374 7265 616d 6920 3b3b 5f5f 6c73 5f5f 4652 376f 7374 7265 616d
2303240 5231 306f 6d61 6e69 705f 696e 7420 3b00 6f61 7070 6c79 5f69 6e74 3a54 2830 2c35 3129 3d73 3466 6374 5f5f 3130 6f61 7070
2303320 6c79 5f69 6e74 3a28 302c 3439 292c 302c 3332 3b3b 006f 6170 706c 795f 696e 743a 5a63 6f61 7070 6c79 5f69 6e74 3b3b 5f5f
2303400 6374 5f5f 3130 6f61 7070 6c79 5f69 6e74 4650 4652 376f 7374 7265 616d 695f 5237 6f73 7472 6561 6d20 5f5f 636c 5f5f 3130
2303460 6f61 7070 6c79 5f69 6e74 4669 203b 3b3b 0069 6f6d 616e 6970 5f69 6e74 3a54 2830 2c35 3229 3d73 3866 6374 5f5f 3131 696f
2303540 6d61 6e69 705f 696e 743a 2830 2c35 3329 3d2a 2830 2c35 3429 3d66 2830 2c35 3529 3d2a 2830 2c33 3529 2c30 2c33 323b 6172
2303620 675f 5f31 3169 6f6d 616e 6970 5f69 6e74 3a28 302c 3129 2c33 322c 3332 3b3b 0069 6f6d 616e 6970 5f69 6e74 3a5a 6369 6f6d
2303700 616e 6970 5f69 6e74 3b3b 5f5f 6374 5f5f 3131 696f 6d61 6e69 705f 696e 7446 5046 5238 696f 7374 7265 616d 695f 5238 696f
2303760 7374 7265 616d 6920 3b3b 5f5f 6c73 5f5f 4652 3869 6f73 7472 6561 6d52 3131 696f 6d61 6e69 705f 696e 7420 5f5f 7273 5f5f
2304040 4652 3869 6f73 7472 6561 6d52 3131 696f 6d61 6e69 705f 696e 7420 3b00 696f 6170 706c 795f 696e 743a 5428 302c 3536 293d
2304120 7334 6663 745f 5f31 3169 6f61 7070 6c79 5f69 6e74 3a28 302c 3533 292c 302c 3332 3b3b 0069 6f61 7070 6c79 5f69 6e74 3a5a
2304200 6369 6f61 7070 6c79 5f69 6e74 3b3b 5f5f 6374 5f5f 3131 696f 6170 706c 795f 696e 7446 5046 5238 696f 7374 7265 616d 695f
2304260 5238 696f 7374 7265 616d 205f 5f63 6c5f 5f31 3169 6f61 7070 6c79 5f69 6e74 4669 203b 3b3b 0073 6d61 6e69 705f 6c6f 6e67
2304340 3a54 2830 2c35 3729 3d73 3866 6374 5f5f 3131 736d 616e 6970 5f6c 6f6e 673a 2830 2c34 3029 2c30 2c33 323b 6172 675f 5f31
2304420 3173 6d61 6e69 705f 6c6f 6e67 3a28 302c 3129 2c33 322c 3332 3b3b 0073 6d61 6e69 705f 6c6f 6e67 3a5a 6373 6d61 6e69 705f
2304500 6c6f 6e67 3b3b 5f5f 6374 5f5f 3131 736d 616e 6970 5f6c 6f6e 6746 5046 5233 696f 736c 5f52 3369 6f73 6c20 3b3b 5f5f 6c73
2304560 5f5f 4652 376f 7374 7265 616d 5231 3173 6d61 6e69 705f 6c6f 6e67 205f 5f72 735f 5f46 5237 6973 7472 6561 6d52 3131 736d
2304640 616e 6970 5f6c 6f6e 6720 3b00 7361 7070 6c79 5f6c 6f6e 673a 5428 302c 3538 293d 7334 6663 745f 5f31 3173 6170 706c 795f
2304720 6c6f 6e67 3a28 302c 3430 292c 302c 3332 3b3b 0073 6170 706c 795f 6c6f 6e67 3a5a 6373 6170 706c 795f 6c6f 6e67 3b3b 5f5f
2305000 6374 5f5f 3131 7361 7070 6c79 5f6c 6f6e 6746 5046 5233 696f 736c 5f52 3369 6f73 205f 5f63 6c5f 5f31 3173 6170 706c 795f
2305060 6c6f 6e67 466c 203b 3b3b 0069 6d61 6e69 705f 6c6f 6e67 3a54 2830 2c35 3929 3d73 3866 6374 5f5f 3131 696d 616e 6970 5f6c
2305140 6f6e 673a 2830 2c34 3429 2c30 2c33 323b 6172 675f 5f31 3169 6d61 6e69 705f 6c6f 6e67 3a28 302c 3129 2c33 322c 3332 3b3b
2305220 0069 6d61 6e69 705f 6c6f 6e67 3a5a 6369 6d61 6e69 705f 6c6f 6e67 3b3b 5f5f 6374 5f5f 3131 696d 616e 6970 5f6c 6f6e 6746
2305300 5046 5237 6973 7472 6561 6d6c 5f52 3769 7374 7265 616d 6c20 3b3b 5f5f 7273 5f5f 4652 3769 7374 7265 616d 5231 3169 6d61
2305360 6e69 705f 6c6f 6e67 203b 0069 6170 706c 795f 6c6f 6e67 3a54 2830 2c36 3029 3d73 3466 6374 5f5f 3131 6961 7070 6c79 5f6c
2305440 6f6e 673a 2830 2c34 3429 2c30 2c33 323b 3b00 6961 7070 6c79 5f6c 6f6e 673a 5a63 6961 7070 6c79 5f6c 6f6e 673b 3b5f 5f63
2305520 745f 5f31 3169 6170 706c 795f 6c6f 6e67 4650 4652 3769 7374 7265 616d 6c5f 5237 6973 7472 6561 6d20 5f5f 636c 5f5f 3131
2305600 6961 7070 6c79 5f6c 6f6e 6746 6c20 3b3b 3b00 6f6d 616e 6970 5f6c 6f6e 673a 5428 302c 3631 293d 7338 6663 745f 5f31 316f
2305660 6d61 6e69 705f 6c6f 6e67 3a28 302c 3439 292c 302c 3332 3b61 7267 5f5f 3131 6f6d 616e 6970 5f6c 6f6e 673a 2830 2c31 292c
```

```
2305740 3332 2c33 323b 3b00 6f6d 616e 6970 5f6c 6f6e 673a 5a63 6f6d 616e 6970 5f6c 6f6e 673b 3b5f 5f63 745f 5f31 316f 6d61 6e69
2306020 705f 6c6f 6e67 4650 4652 376f 7374 7265 616d 6c5f 5237 6f73 7472 6561 6d6c 203b 3b5f 5f6c 735f 5f46 5237 6f73 7472 6561
2306100 6d52 3131 6f6d 616e 6970 5f6c 6f6e 6720 3b00 6f61 7070 6c79 5f6c 6f6e 673a 5428 302c 3632 293d 7334 6663 745f 5f31 316f
2306160 6170 706c 795f 6c6f 6e67 3a28 302c 3439 292c 302c 3332 3b3b 006f 6170 706c 795f 6c6f 6e67 3a5a 636f 6170 706c 795f 6c6f
2306240 6e67 3b3b 5f5f 6374 5f5f 3131 6f61 7070 6c79 5f6c 6f6e 6746 5046 5237 6f73 7472 6561 6d6c 5f52 376f 7374 7265 616d 205f
2306320 5f63 6c5f 5f31 316f 6170 706c 795f 6c6f 6e67 466c 203b 3b3b 0069 6f6d 616e 6970 5f6c 6f6e 673a 5428 302c 3633 293d 7338
2306400 6663 745f 5f31 3269 6f6d 616e 6970 5f6c 6f6e 673a 2830 2c35 3329 2c30 2c33 323b 6172 675f 5f31 3269 6f6d 616e 6970 5f6c
2306460 6f6e 673a 2830 2c31 292c 3332 2c33 323b 3b00 696f 6d61 6e69 705f 6c6f 6e67 3a5a 6369 6f6d 616e 6970 5f6c 6f6e 673b 3b5f
2306540 5f63 745f 5f31 3269 6f6d 616e 6970 5f6c 6f6e 6746 5046 5238 696f 7374 7265 616d 6c5f 5238 696f 7374 7265 616d 6c20 3b3b
2306620 5f5f 6c73 5f5f 4652 3069 6f73 7472 6561 6d52 3132 696f 6d61 6e69 705f 6c6f 6e67 205f 5f72 735f 5f46 5238 696f 7374 7265
2306700 616d 5231 3269 6f6d 616e 6970 5f6c 6f6e 6720 3b00 696f 6170 706c 795f 6c6f 6e67 3a54 2830 2c36 3429 3d73 3466 6374 5f5f
2306760 3132 696f 6170 706c 795f 6c6f 6e67 3a28 302c 3533 292c 302c 3332 3b3b 0069 6f61 7070 6c79 5f6c 6f6e 673a 5a63 696f 6170
2307040 706c 795f 6c6f 6e67 3b3b 5f5f 6374 5f5f 3132 696f 6170 706c 795f 6c6f 6e67 4650 4652 3869 6f73 7472 6561 6d6c 5f52 3869
2307120 6f73 7472 6561 6d20 5f5f 636c 5f5f 3132 696f 6170 706c 795f 6c6f 6e67 466c 203b 3b3b 0065 7272 6e6f 3a47 2830 2c31 2900
2307200 7379 735f 6e65 7272 3a47 2830 2c31 2900 7374 6469 6f62 7566 3a54 2830 2c36 3629 3d73 3532 616c 6c6f 635f 5f39 7374 7265
2307260 616d 6275 663a 2830 2c34 292c 302c 3136 3b78 5f75 6e62 7566 5f5f 3973 7472 6561 6d62 7566 3a28 302c 3429 2c31 362c 3136
2307340 3b78 5f62 6173 655f 5f39 7374 7265 616d 6275 663a 2830 2c33 3129 2c33 322c 3332 3b78 5f70 6261 7365 5f5f 3973 7472 6561
2307420 6d62 7566 3a28 302c 3331 292c 3634 2c33 323b 785f 7070 7472 5f5f 3973 7472 6561 6d62 7566 3a28 302c 3331 292c 3936 2c33
2307500 323b 785f 6570 7074 725f 5f39 7374 7265 616d 6275 663a 2830 2c33 3129 2c31 3238 2c33 323b 785f 6770 7472 5f5f 3973 7472
2307560 6561 6d62 7566 3a28 302c 3331 292c 3136 302c 3332 3b78 5f65 6770 7472 5f5f 3973 7472 6561 6d62 7566 3a28 302c 3331 292c
2307640 3139 322c 3332 3b5c 0078 5f65 6261 636b 5f5f 3973 7472 6561 6d62 7566 3a28 302c 3331 292c 3232 342c 3332 3b78 5f62 6c65
2307720 6e5f 5f39 7374 7265 616d 6275 663a 2830 2c31 292c 3235 362c 3332 3b5f 5f76 7074 725f 5f39 7374 7265 616d 6275 663a 2830
2310000 2c33 3029 2c32 3838 2c33 323b 6670 5f5f 3873 7464 696f 6275 663a 2830 2c36 3729 3d2a 2830 2c36 3529 3d78 735f 696f 6275
2310060 663a 2c33 3230 2c33 323b 6c61 7374 5f6f 705f 5f38 7374 6469 6f62 7566 3a28 302c 3129 2c33 3532 2c33 323b 6275 665f 5f38
2310140 7374 6469 6f62 7566 3a28 302c 3638 293d 6172 2830 2c31 293b 303b 313b 2830 2c32 292c 3338 342c 3136 3b3b 0073 7464 696f
2310220 6275 663a 5a63 7374 6469 6f62 7566 3b73 7472 6561 6d62 7566 3b6f 7665 7266 6c6f 775f 5f38 7374 6469 6f62 7566 4669 2075
2310300 6e64 6572 666c 6f77 5f5f 3873 7464 695f 6275 6646 7620 7379 6e63 5f5f 3873 7464 696f 6275 6646 7620 7365 656b 6f66 665f
2310360 5f38 7374 6469 6f62 7566 466c 3873 6565 6b5f 6469 7269 2070 6261 636b 6661 696c 5f5f 3873 7464 696f 6275 6646 6920 5f5f
2310440 6374 5f5f 3873 7464 696f 6275 6646 5036 5f69 6f62 7566 205f 5f63 745f 5f38 7374 6469 6f62 7566 4652 4338 7374 6469 6f62
2310520 7566 205c 0073 7464 696f 6669 6c65 5f5f 3873 7464 696f 6275 6646 7620 5f5f 6474 5f5f 3873 7464 696f 6275 6646 7620 3b3b
2310600 3b00 6669 6c65 6275 663a 5428 302c 3639 293d 7336 3461 6c6c 6f63 5f5f 3973 7472 6561 6d62 7566 3a28 302c 3429 2c30 2c31
2310660 363b 785f 756e 6275 665f 5f39 7374 7265 616d 6275 663a 2830 2c34 292c 3136 2c31 363b 785f 6261 7365 5f5f 3973 7472 6561
2310740 6d62 7566 3a28 302c 3331 292c 3332 2c33 323b 785f 7062 6173 655f 5f39 7374 7265 616d 6275 663a 2830 2c33 3129 2c36 342c
2311020 3332 3b78 5f70 7074 725f 5f39 7374 7265 616d 6275 663a 2830 2c33 3129 2c39 362c 3332 3b78 5f65 7070 7472 5f5f 3973 7472
2311100 6561 6d62 7566 3a28 302c 3331 292c 3132 382c 3332 3b78 5f67 7074 725f 5f39 7374 7265 616d 6275 663a 2830 2c33 3129 2c31
2311160 3630 2c33 323b 795f 6567 7074 725f 5f39 7374 7265 616d 6275 663a 2830 2c33 3129 2c31 3932 2c33 323b 5c00 785f 6562 6163
2311240 6b5f 5f39 7374 7265 616d 6275 663a 2830 2c33 3129 2c32 3234 2c33 323b 785f 626c 656e 5f5f 3973 7472 6561 6d62 7566 3a28
2311320 302c 3129 2c32 3536 2c33 323b 5f5f 7670 7472 5f5f 3973 7472 6561 6d62 7566 3a28 302c 3330 292c 3238 382c 3332 3b78 6664
2311400 5f5f 3766 696c 6562 7566 3a28 302c 3129 2c33 3230 2c33 323b 6d6f 6465 5f5f 3766 696c 6562 7566 3a28 302c 3129 2c33 3532
2311460 2c33 323b 6f70 656e 6564 5f5f 3766 696c 6562 7566 3a28 302c 3229 2c33 3834 2c38 3b6c 6173 745f 7365 656b 5f5f 3766 696c
2311540 6562 7566 3a28 302c 3129 2c34 3136 2c33 323b 696e 5f73 7461 7274 5f5f 3766 696c 6562 7566 3a28 302c 3331 292c 3434 382c
2311620 3332 3b6c 6168 6561 645f 5f37 6669 6c65 6275 663a 2830 2c36 3829 2c34 3830 2c31 363b 3b00 6f70 656e 7072 6f74 5f5f 3766
2311700 696c 6562 7566 3a47 2830 2c31 2900 6669 6c65 6275 663a 5a63 6669 6c65 6275 663b 7374 7265 616d 6275 663b 5f5f 6374 5f5f
2311760 3766 696c 6562 7566 4676 205f 5f63 745f 5f37 6669 6c65 6275 6646 6920 5f5f 6374 5f5f 3766 696c 6562 7566 4669 5063 5431
2312040 205f 5f63 745f 5f37 6669 6c65 6275 6646 5243 3766 696c 6562 7566 2069 735f 6f70 656e 5f5f 3766 696c 6562 7566 4676 2066
2312120 645f 5f37 6669 6c65 6275 6646 7620 6f70 656e 5f5f 3766 696c 6562 7566 4650 4363 6954 3220 6174 7461 6368 5f5f 3766 696c
2312200 6562 7566 4669 2063 6c6f 7365 5f5f 3766 696c 6562 7566 4676 205c 005f 5f64 745f 5f37 6669 6c65 6275 6646 7620 6f76 6572
2312260 666c 6f77 5f5f 3766 696c 6562 7566 4669 2075 6e64 6572 666c 6f77 5f5f 3766 696c 6562 7566 4676 2073 796e 635f 5f37 6669
2312340 6c65 6275 6646 7620 7365 656b 6f66 665f 5f37 6669 6c65 6275 6646 6c38 7365 656b 5f64 6972 6920 7365 7462 7566 5f5f 3766
2312420 696c 6562 7566 4650 6369 206c 6173 745f 6f70 5f5f 3766 696c 6562 7566 4676 203b 6f70 656e 7072 6f74 5f5f 3766 696c 6562
2312500 7566 203b 3b00 6673 7472 6561 6d62 6173 653a 5428 302c 3730 293d 7331 3332 6275 665f 5f31 3166 7374 7265 616d 6261 7365
2312560 3a28 302c 3639 292c 302c 3531 323b 5f5f 7670 7472 5f5f 3131 6673 7472 6561 6d62 6173 653a 2830 2c33 3029 2c35 3132 2c33
2312640 323b 5069 6f73 3a28 302c 3333 292c 3534 342c 3332 3b4f 696f 733a 2830 2c32 3329 2c35 3736 2c34 3830 3b3b 0066 7374 7265
2312720 616d 6261 7365 3a5a 6366 7374 7265 616d 6261 7365 3b69 6f73 3b5f 5f63 745f 5f31 3166 7374 7265 616d 6261 7365 4676 205f
2313000 5f63 745f 5f31 3166 7374 7265 616d 6251 7365 4650 4363 6954 3220 5f5f 6374 5f5f 3131 6673 7472 6561 6d62 6173 6546 6920
```

| | | | | | | | | | | | | | | | | |
|---|---|---|---|---|---|---|---|---|---|---|---|---|---|---|---|---|
| 2313060 | 5f5f 6374 | 5f5f 3131 | 6673 7472 | 6561 6d62 | 6173 6546 | 6950 6354 | 3120 5f5f | 6374 5f5f | 3131 6673 | 7472 6561 | 6d62 6173 | 6546 5231 | | | | |
| 2313140 | 3166 7374 | 7265 616d | 6261 7365 | 205f 5f64 | 745f 5f31 | 3166 7374 | 7265 616d | 6261 7365 | 4676 206f | 7065 6e5f | 5f31 3166 | 7374 7265 | | | | |
| 2313220 | 616d 6261 | 7365 4650 | 4363 6954 | 3220 5c00 | 6174 7461 | 6368 5f5f | 3131 6673 | 7472 6561 | 6d62 6173 | 6546 6920 | 636c 6f73 | 655f 5f31 | | | | |
| 2313300 | 3166 7374 | 7265 616d | 6261 7365 | 4676 2073 | 6574 6275 | 665f 5f31 | 3166 7374 | 7265 616d | 6261 7365 | 4650 6369 | 2072 6462 | 7566 5f5f | | | | |
| 2313360 | 3131 6673 | 7472 6561 | 6d62 6173 | 6546 7620 | 7665 7269 | 6679 5f5f | 3131 6673 | 7472 6561 | 6d62 6173 | 6546 6920 | 3b3b 3b00 | 7374 6174 | | | | |
| 2313440 | 655f 7661 | 6c75 653a | 7428 302c | 3138 2900 | 4f62 6a65 | 6374 3a54 | 2830 2c37 | 3129 3d73 | 345f 5f76 | 7074 725f | 5f36 4f62 | 6a65 6374 | | | | |
| 2313520 | 3a28 332c | 3330 292c | 302c 3332 | 3b3b 004f | 626a 6563 | 743a 5a63 | 4f62 6a65 | 6374 3b3b | 5f5f 6374 | 5f5f 364f | 626a 6563 | 7446 7620 | | | | |
| 2313600 | 5f5f 6374 | 5f5f 364f | 626a 6563 | 7446 5243 | 364f 626a | 6563 7420 | 6572 726f | 724d 656d | 6f72 795f | 5f36 4f62 | 6a65 6374 | 4650 6354 | | | | |
| 2313660 | 3120 6578 | 706c 6169 | 6e5f 5f36 | 4f62 6a65 | 6374 4650 | 6320 696e | 4f72 6465 | 725f 5f36 | 4f62 6a65 | 6374 4650 | 364f 626a | 6563 7420 | | | | |
| 2313740 | 3b3b 3b00 | 5f5f 7074 | 626c 5f5f | 364f 626a | 6563 745f | 5f65 6e74 | 6974 795f | 6378 783a | 4728 302c | 3330 2900 | 5046 3a74 | 2830 2c31 | | | | |
| 2314020 | 3529 0050 | 4643 3a74 | 2830 2c31 | 3529 0050 | 4649 3a74 | 2830 2c31 | 3529 004e | 4f62 6a65 | 6374 3a54 | 2830 2c37 | 3229 3d73 | 385f 5f76 | | | | |
| 2314100 | 7074 725f | 5f36 4f62 | 6a65 6374 | 3a28 302c | 3330 292c | 302c 3332 | 3b6e 616d | 655f 5f37 | 4e4f 626a | 6563 743a | 2830 2c33 | 3129 2c33 | | | | |
| 2314160 | 322c 3332 | 3b3b 004e | 4f62 6a65 | 6374 3a5a | 634e 4f62 | 6a65 6374 | 3b4f 626a | 6563 743b | 5f5f 6374 | 5f5f 374e | 4f62 6a65 | 6374 4650 | | | | |
| 2314240 | 6320 5f5f | 6374 5f5f | 374e 4f62 | 6a65 6374 | 4652 4337 | 4e4f 626a | 6563 7420 | 7365 744e | 616d 655f | 5f37 4e4f | 626a 6563 | 7446 5063 | | | | |
| 2314320 | 2067 6574 | 4e61 6d65 | 5f5f 374e | 4f62 6a65 | 6374 4676 | 2065 7870 | 6c61 696e | 5f5f 374e | 4f62 6a65 | 6374 4650 | 6320 6765 | 7441 7474 | | | | |
| 2314400 | 725f 5f37 | 4e4f 626a | 6563 7446 | 6920 6765 | 7450 726f | 705f 5f37 | 4e4f 626a | 6563 7446 | 5063 6920 | 7365 7450 | 726f 705f | 5f37 4e4f | | | | |
| 2314460 | 626a 6563 | 7446 5063 | 5431 205c | 0073 6574 | 5072 6f70 | 5f5f 374e | 4f62 6a65 | 6374 4650 | 6369 2073 | 6574 5072 | 6f70 5f5f | 374e 4f62 | | | | |
| 2314540 | 6a65 6374 | 4650 6366 | 2069 7347 | 5445 5f5f | 374e 4f62 | 6a65 6374 | 4650 364f | 626a 6563 | 7420 6973 | 4c54 455f | 5f37 4e4f | 626a 6563 | | | | |
| 2314620 | 7446 5036 | 4f62 6a65 | 6374 203b | 3b3b 006f | 7374 7265 | 616d 5f77 | 6974 6861 | 7373 6967 | 6e3a 5428 | 302c 3337 | 293d 7336 | 385f 5f76 | | | | |
| 2314700 | 7074 725f | 5f37 6f73 | 7472 6561 | 6d3a 2830 | 2c33 3029 | 2c30 2c33 | 323b 5069 | 6f73 3a28 | 302c 3333 | 292c 3332 | 2c33 323b | 4f69 6f73 | | | | |
| 2314760 | 3a28 302c | 3233 292c | 3634 2c34 | 3830 3b3b | 006f 7374 | 7265 616d | 5f77 6974 | 6861 7373 | 6967 6e3a | 5a63 6f73 | 7472 6561 | 6d5f 7769 | | | | |
| 2315040 | 7468 6173 | 7369 676e | 3b6f 7374 | 7265 616d | 2069 6f73 | 3b5f 5f63 | 745f 5f31 | 386f 7374 | 7265 616d | 5f77 6974 | 6861 7373 | 6967 6e46 | | | | |
| 2315120 | 7620 5f5f | 6374 5f5f | 3138 6f73 | 7472 6561 | 6d5f 7769 | 7468 6173 | 7369 676e | 4652 3138 | 6f73 7472 | 6561 6d5f | 7769 7468 | 6173 7369 | | | | |
| 2315200 | 676e 205f | 5f64 745f | 5f31 386f | 7374 7265 | 616d 5f77 | 6974 6861 | 7373 6967 | 6e46 7620 | 5f5f 6173 | 5f5f 3138 | 6f73 7472 | 6561 6d5f | | | | |
| 2315260 | 7769 7468 | 6173 7369 | 676e 4652 | 376f 7374 | 7265 616d | 205c 005f | 5f61 735f | 5f31 386f | 7374 7265 | 616d 5f77 | 6974 6861 | 7373 6967 | | | | |
| 2315340 | 6e46 5039 | 7374 7265 | 616d 6275 | 6620 3b3b | 3b00 5046 | 423a 7428 | 302c 3135 | 2900 4c4e | 4f62 6a65 | 6374 3a54 | 2830 2c37 | 3329 3d73 | | | | |
| 2315420 | 3132 5f5f | 7670 7472 | 5f5f 364f | 626a 6563 | 743a 2830 | 2c33 3029 | 2c30 2c33 | 323b 6e61 | 6d65 5f5f | 374e 4f62 | 6a65 6374 | 3a28 302c | | | | |
| 2315500 | 3331 292c | 3332 2c33 | 323b 6e65 | 7874 5f5f | 384c 4e4f | 626a 6563 | 743a 2830 | 2c37 3429 | 3d2a 2830 | 2c37 3329 | 2c36 342c | 3332 3b3b | | | | |
| 2315560 | 004c 4e4f | 626a 6563 | 743a 5a63 | 4c4e 4f62 | 6a65 6374 | 3b4e 4f62 | 6a65 6374 | 3b5f 5f63 | 745f 5f38 | 4c4e 4f62 | 6a65 6374 | 4650 6350 | | | | |
| 2315640 | 384c 4e4f | 626a 6563 | 7420 5f5f | 6374 5f5f | 384c 4e4f | 626a 6563 | 7446 5243 | 384c 4e4f | 626a 6563 | 7420 7365 | 744e 6578 | 745f 5f38 | | | | |
| 2315720 | 4c4e 4f62 | 6a65 6374 | 4650 384c | 4e4f 626a | 6563 7420 | 6765 744e | 6578 745f | 5f38 4c4e | 4f62 6a65 | 6374 4676 | 203b 3b3b | 004c 4f62 | | | | |
| 2316000 | 6a65 6374 | 3a54 2830 | 2c37 3529 | 3d73 385f | 5f76 7074 | 725f 5f36 | 4f62 6a65 | 6374 3a28 | 302c 3330 | 292c 302c | 3332 3b6e | 6578 745f | | | | |
| 2316060 | 5f37 4c4f | 626a 6563 | 743a 2830 | 2c37 3629 | 3d2a 2830 | 2c37 3529 | 2c33 322c | 3332 3b3b | 004c 4f62 | 6a65 6374 | 3a5a 634c | 4f62 6a65 | | | | |
| 2316140 | 6374 3b4f | 626a 6563 | 743b 5f5f | 6374 5f5f | 374c 4f62 | 6a65 6374 | 4650 374c | 4f62 6a65 | 6374 205f | 5f63 745f | 5f37 4c4f | 626a 6563 | | | | |
| 2316220 | 7446 5243 | 374c 4f62 | 6a65 6374 | 2073 6574 | 4e65 7874 | 5f5f 374c | 4f62 6a65 | 6374 4650 | 374c 4f62 | 6a65 6374 | 2067 6574 | 4e65 7874 | | | | |
| 2316300 | 5f5f 374c | 4f62 6a65 | 6374 4676 | 203b 3b3b | 004c 504f | 626a 6563 | 743a 5428 | 302c 3737 | 293d 7331 | 325f 5f76 | 7074 725f | 5f36 4f62 | | | | |
| 2316360 | 6a65 6374 | 3a28 302c | 3330 292c | 302c 3332 | 3b6e 6578 | 745f 5f37 | 4c4f 626a | 6563 743a | 2830 2c37 | 3629 2c33 | 322c 3332 | 3b6e 6f62 | | | | |
| 2316440 | 6a70 7472 | 5f5f 384c | 504f 626a | 6563 743a | 2830 2c37 | 3829 3d2a | 2830 2c37 | 3229 2c36 | 342c 3332 | 3b3b 004c | 504f 626a | 6563 743a | | | | |
| 2316520 | 5a63 4c50 | 4f62 6a65 | 6374 3b4c | 4f62 6a65 | 6374 3b5f | 5f63 745f | 5f38 4c50 | 4f62 6a65 | 6374 4650 | 374e 4f62 | 6a65 6374 | 5037 4c4f | | | | |
| 2316600 | 626a 6563 | 7420 5f5f | 6374 5f5f | 384c 504f | 626a 6563 | 7446 5243 | 384c 504f | 626a 6563 | 7420 7365 | 744f 626a | 6563 745f | 5f38 4c50 | | | | |
| 2316660 | 4f62 6a65 | 6374 4650 | 374e 4f62 | 6a65 6374 | 2067 6574 | 4f62 6a65 | 6374 5f5f | 384c 504f | 626a 6563 | 7446 7620 | 6578 706c | 6169 6e5f | | | | |
| 2316740 | 5f38 4c50 | 4f62 6a65 | 6374 4650 | 6320 3b3b | 3b00 5f5f | 7074 626c | 5f5f 384c | 504f 626a | 6563 745f | 5f65 6e74 | 6974 795f | 6378 783a | | | | |
| 2317020 | 4728 302c | 3330 2900 | 4c69 7374 | 3a54 2830 | 2c37 3929 | 3d73 3132 | 636f 756e | 745f 5f34 | 4c69 7374 | 3a28 302c | 3129 2c30 | 2c33 323b | | | | |
| 2317100 | 7074 724c | 4f62 6a65 | 6374 5f5f | 344c 6973 | 743a 2830 | 2c37 3629 | 2c33 322c | 3332 3b5f | 5f76 7074 | 725f 5f34 | 4c69 7374 | 3a28 302c | | | | |
| 2317160 | 3330 292c | 3634 2c33 | 323b 3b00 | 4c69 7374 | 3a5a 634c | 6973 743b | 3b5f 5f63 | 745f 5f34 | 4c69 7374 | 4676 205f | 5f63 745f | 5f34 4c69 | | | | |
| 2317240 | 7374 4652 | 4334 4c69 | 7374 205f | 5f64 745f | 5f34 4c69 | 7374 4676 | 2067 6574 | 436f 756e | 745f 5f34 | 4c69 7374 | 4676 2067 | 6574 546f | | | | |
| 2317320 | 705f 5f34 | 4c69 7374 | 4676 2073 | 6574 546f | 705f 5f34 | 4c69 7374 | 4650 374c | 4f62 6a65 | 6374 2065 | 7272 6f72 | 4d65 6d6f | 7279 5f5f | | | | |
| 2317400 | 344c 6973 | 7446 5063 | 5431 2062 | 726f 6164 | 6361 7374 | 5f5f 344c | 6973 7446 | 4d36 4f62 | 6a65 6374 | 4676 5f76 | 2065 7870 | 6c61 696e | | | | |
| 2317460 | 5f5f 344c | 6973 7446 | 5063 205c | 0069 6e73 | 6572 745f | 5f34 4c69 | 7374 4650 | 374c 4f62 | 6a65 6374 | 2069 734d | 656d 6265 | 725f 5f34 | | | | |
| 2317540 | 4c69 7374 | 4650 374c | 4f62 6a65 | 6374 2069 | 7341 656d | 6265 725f | 5f34 4c69 | 7374 4650 | 6320 6973 | 4571 7561 | 6c5f 5f34 | 4c69 7374 | | | | |
| 2317620 | 4652 344c | 6973 7420 | 7265 6d6f | 7665 5f5f | 344c 6973 | 7446 5063 | 203b 3b3b | 005f 5f70 | 7462 6c5f | 5f34 4c69 | 7374 5f5f | 656e 7469 | | | | |
| 2317700 | 7479 5f63 | 7878 3a47 | 2830 2c33 | 3029 0050 | 4c69 7374 | 3a54 2830 | 2c38 3029 | 3d73 3132 | 636f 756e | 745f 5f34 | 4c69 7374 | 3a28 302c | | | | |
| 2317760 | 3129 2c30 | 2c33 323b | 7074 724c | 4f62 6a65 | 6374 5f5f | 344c 6973 | 743a 2830 | 2c37 3629 | 2c33 322c | 3332 3b5f | 5f76 7074 | 725f 5f34 | | | | |
| 2320040 | 4c69 7374 | 3a28 302c | 3330 292c | 3634 2c33 | 323b 3b00 | 504c 6973 | 743a 5a63 | 504c 6973 | 743b 4c69 | 7374 3b69 | 6e73 6572 | 745f 5f35 | | | | |
| 2320120 | 504c 6973 | 7446 5038 | 4c50 4f62 | 6a65 6374 | 2069 6e73 | 6572 745f | 5f35 504c | 6973 7446 | 5235 504c | 6973 7420 | 536f 7274 | 5f50 4c69 | | | | |

```
2320200  7374 5f5f 3550 4c69 7374 4669 2072 6576 6572 7365 5f5f 3550 4c69 7374 4676 2069 6e73 6572 7441 6674 6572 5f5f 3550 4c69
2320260  7374 4650 384c 504f 626a 6563 7454 3120 7265 636f 7665 5f5f 3550 4c69 7374 4650 384c 504f 626a 6563 7420 7265 6d6f 7665
2320340  5f5f 3550 4c69 7374 4650 6320 6973 4d65 6d62 6572 5f5f 3550 4c69 7374 4650 6320 5c00 6973 4d65 6d62 6572 5f5f 3550 4c69
2320420  7374 4650 374c 4f62 6a65 6374 2069 7345 7175 616c 5f5f 3550 4c69 7374 4652 344c 6973 7420 6578 706c 6169 6e5f 5f35 504c
2320500  6973 7446 5063 205f 5f63 745f 5f35 504c 6973 7446 5243 3550 4c69 7374 205f 5f63 745f 5f35 504c 6973 7446 7620 3b3b 3b00
2320560  5f5f 7074 626c 5f5f 3550 4c69 7374 5f5f 656e 7469 7479 5f63 7878 3a47 2830 2c33 3029 004c 6973 7449 7465 7261 746f 723a
2320640  5428 302c 3831 293d 7338 6c69 7374 5f5f 3132 4c69 7374 4974 6572 6174 6f72 3a28 302c 3832 293d 2a28 302c 3739 292c 302c
2320720  3332 3b70 5f5f 3132 4c69 7374 4974 6572 6174 6f72 3a28 302c 3736 292c 3332 2c33 323b 3b00 4c69 7374 4974 6572 6174 6f72
2321000  3a5a 634c 6973 7449 7465 7261 746f 723b 3b5f 5f63 745f 5f31 324c 6973 7449 7465 7261 746f 7246 5234 4c69 7374 2072 6573
2321060  6574 5f5f 3132 4c69 7374 4974 6572 6174 6f72 4676 2061 7474 6163 685f 5f31 324c 6973 7449 7465 7261 746f 7246 5234 4c69
2321140  7374 2067 6574 4375 7272 656e 745f 5f31 324c 6973 7449 7465 7261 746f 7246 7620 5f5f 7070 5f5f 3132 4c69 7374 4974 6572
2321220  6174 6f72 4676 203b 3b3b 0056 616c 7565 5f54 7970 653a 5428 302c 3833 293d 6555 4e4b 4e4f 574e 563a 302c 5354 5249 4e47
2321300  3a31 2c49 4e54 4547 4552 3a32 2c46 4c4f 4154 3a33 2c3b 0042 6c6f 636b 5f54 7970 653a 5428 302c 3834 293d 6555 4e4b 4e4f
2321360  574e 423a 302c 454e 5449 5459 3a31 2c46 554e 4354 494f 4e3a 322c 5052 4f43 4544 5552 453a 332c 3b00 456e 7469 7479 5f54
2321440  7970 653a 5428 302c 3835 293d 6555 4e4b 4e4f 574e 453a 302c 4152 4348 4954 4543 5455 5245 3a31 2c53 5542 5052 4f47 5241
2321520  4d3a 322c 3b00 5069 6e5f 5479 7065 3a54 2830 2c38 3629 3d65 554e 4b4e 4f57 4e50 3a30 2c49 4e50 494e 3a31 2c4f 5554 5049
2321600  4e3a 322c 494e 4f55 5450 494e 3a33 2c3b 0050 6172 615f 436c 6173 733a 5428 302c 3837 293d 6555 4e4b 4e4f 574e 433a 302c
2321660  464f 524d 414c 3a31 2c41 4354 5541 4c3a 322c 5245 534f 4c56 4544 3a33 2c3b 0042 4f4f 4c45 414e 3a54 2830 2c38 3829 3d65
2321740  4661 6c73 653a 302c 5472 7565 3a31 2c3b 0042 6f6f 6c65 616e 3a54 2830 2c38 3929 3d65 6661 6c73 653a 302c 7472 7565 3a31
2322020  2c3b 0042 7566 6665 723a 4728 302c 3331 2900 656e 7469 7479 3a54 2830 2c39 3029 3d73 3630 5f5f 7670 7472 5f5f 364f 626a
2322100  6563 743a 2830 2c33 3029 2c30 2c33 323b 6e61 6d65 5f5f 374e 4f62 6a65 6374 3a28 302c 3331 292c 3332 2c33 323b 6e61 6d65
2322160  5f5f 3665 6e74 6974 793a 2830 2c33 3129 2c36 342c 3332 3b46 696c 654e 616d 655f 5f36 656e 7469 7479 3a28 302c 3331 292c
2322240  3936 2c33 323b 6172 6368 6e61 6465 5f5f 3665 6e74 6974 793a 2830 2c33 3129 2c31 3238 2c33 323b 7479 7065 5f5f 3665 6e74
2322320  6974 793a 2830 2c31 292c 3136 302c 3332 3b61 7263 685f 6c69 6e65 5f5f 3665 6e74 6974 793a 2830 2c31 292c 3139 322c 3332
2322400  3b63 616c 6c5f 6c69 6e65 5f5f 3665 6e74 6974 793a 2830 2c31 292c 3232 342c 3332 3b5c 0070 7263 735f 6c69 6e65 5f5f 3665
2322460  6e74 6974 793a 2830 2c31 292c 3235 362c 3332 3b71 7561 6c69 6669 6564 5f5f 3665 6e74 6974 793a 2830 2c38 3029 2c32 3838
2322540  2c39 363b 7375 625f 626c 6f63 6b73 5f5f 3665 6e74 6974 793a 2830 2c38 3029 2c33 3834 2c39 363b 3b00 656e 7469 7479 3a5a
2322620  6365 6e74 6974 793b 4e4f 626a 6563 743b 5f5f 6374 5f5f 3665 6e74 6974 7946 7620 5f5f 6374 5f5f 3665 6e74 6974 7946 5243
2322700  3665 6e74 6974 7920 5f5f 6474 5f5f 3665 6e74 6974 7946 7620 7365 745f 656e 7469 7479 5f6e 616d 655f 5f36 656e 7469 7479
2322760  4650 6320 7365 745f 656e 7469 7479 5f66 696c 655f 5f36 656e 7469 7479 4650 6320 7365 745f 656e 7469 7479 5f61 7263 686e
2323040  616d 655f 5f36 656e 7469 7479 4650 6320 7365 745f 656e 7469 7479 5f74 7970 655f 5f36 656e 7469 7479 4650 6320 5c00 7365
2323120  745f 6172 6368 5f6c 696e 655f 5f36 656e 7469 7479 4669 2073 6574 5f63 616c 6c5f 6c69 6e65 5f5f 3665 6e74 6974 7946 6920
2323200  7365 745f 7072 6373 5f6c 696e 655f 5f36 656e 7469 7479 4669 2067 6574 5f65 6e74 6974 795f 6e61 6d65 5f5f 3665 6e74 6974
2323260  7946 7620 6765 745f 656e 7469 7479 5f61 7263 686e 616d 655f 5f36 656e 7469 7479 4676 2067 6574 5f65 6e74 6974 795f 6669
2323340  6c65 5f5f 3665 6e74 6974 7946 7620 6765 745f 656e 7469 7479 5f74 7970 655f 5f36 656e 7469 7479 4676 205c 0067 6574 5f61
2323420  7263 685f 6c69 6e65 5f5f 3665 6e74 6974 7946 7620 6765 745f 6361 6c6c 5f6c 696e 655f 5f36 656e 7469 7479 4676 2067 6574
2323500  5f70 7263 735f 6c69 6e65 5f5f 3665 6e74 6974 7946 7620 6973 4754 455f 5f36 656e 7469 7479 4650 364f 626a 6563 7420 6973
2323560  4c54 455f 5f36 656e 7469 7479 4650 364f 626a 6563 7420 6578 706c 6169 6e5f 5f36 656e 7469 7479 4650 6320 3b3b 3b00 5f5f
2323640  7074 626c 5f5f 3665 6e74 6974 795f 5f65 6e74 6974 795f 6378 783a 4728 302c 3330 2900 7365 745f 656e 7469 7479 5f74 7970
2323720  655f 5f36 656e 7469 7479 4650 633a 4628 302c 3229 005f 5f30 7468 6973 3a70 2830 2c39 3129 3d2a 2830 2c39 3029 005f 5f30
2324000  733a 7028 302c 3331 2900 656e 7469 7479 2e63 7878 005f 5f30 7468 6973 3a72 2830 2c39 3129 005f 5f30 7468 6973 203a 5a74
2324060  6c00 5f5f 3073 203a 5a74 6c00 7365 745f 656e 7469 7479 5f74 7970 655f 5f36 656e 7469 7479 4650 6320 3a5a 7446 0065 7870
2324140  6c61 696e 5f5f 3665 6e74 6974 7946 5063 3a46 2830 2c32 2900 5f5f 3074 6869 733a 7028 302c 3931 2900 5f5f 3073 3a70 2830
2324220  2c33 3129 005f 5f30 7468 6973 3a72 2830 2c39 3129 005f 5f30 7468 6973 203a 5a74 6c00 5f5f 3073 203a 5a74 6c00 6578 706c
2324300  6169 6e5f 5f36 656e 7469 7479 4650 6320 3a5a 7446 0069 7347 5445 5f5f 3665 6e74 6974 7946 5036 4f62 6a65 6374 3a46 2830
2324360  2c31 2900 5f5f 3074 6869 733a 7028 302c 3931 2900 5f5f 3061 3a70 2830 2c39 3229 3d2a 2830 2c37 3129 005f 5f30 7468 6973
2324440  3a72 2830 2c39 3129 005f 5f30 7468 6973 203a 5a74 6c00 5f5f 3061 203a 5a74 6c00 6973 4754 455f 5f36 656e 7469 7479 4650
2324520  364f 626a 6563 7420 3a5a 7446 0069 734c 5445 5f5f 3665 6e74 6974 7946 5036 4f62 6a65 6374 3a46 2830 2c31 2900 5f5f 3074
2324600  6869 733a 7028 302c 3931 2900 5f5f 3061 3a70 2830 2c39 3229 005f 5f30 7468 6973 3a72 2830 2c39 3129 005f 5f30 7468 6973
2324660  203a 5a74 6c00 5f5f 3061 203a 5a74 6c00 6973 4c54 455f 5f36 656e 7469 7479 4650 364f 626a 6563 7420 3a5a 7446 005f 5f73
2324740  7469 5f5f 656e 7469 7479 5f63 7878 5f73 6574 5f65 6e74 6974 795f 7479 7065 5f3a 4628 302c 3229 002f 7573 722f 4343 2f73
2325020  756e 342f 696e 636c 2f69 6f73 7472 6561 6d2e 6800 5f5f 7374 645f 5f65 6e74 6974 795f 6378 785f 7365 745f 656e 7469 7479
2325100  5f74 7970 655f 3a46 2830 2c32 2900 5f5f 7674 626c 5f5f 3665 6e74 6974 793a 4728 302c 3933 293d 6172 2830 2c31 293b 303b
2325160  3130 3b28 302c 3135 2900 5f5f 7674 626c 5f5f 384c 504f 626a 6563 745f 5f65 6e74 6974 795f 6378 783a 4728 302c 3934 293d
2325240  6172 2830 2c31 293b 303b 333b 2830 2c31 3529 0065 7870 6c61 696e 5f5f 384c 504f 626a 6563 7446 5063 3a66 2830 2c32 2900
```

| | | | | | | | | | | | | | | | | | | | | | | | | |
|---|---|---|---|---|---|---|---|---|---|---|---|---|---|---|---|---|---|---|---|---|---|---|---|---|
| 2325320 | 5f5f | 3074 | 6869 | 733a | 7028 | 302c | 3935 | 293d | 2a28 | 302c | 3737 | 2900 | 5f5f | 3073 | 3a70 | 2830 | 2c33 | 3129 | 002f | 686f | 6d65 | 2f6f | 7361 | 7331 |
| 2325400 | 2f61 | 2f61 | 622f | 7372 | 632f | 6e65 | 776f | 626a | 6563 | 7473 | 2f68 | 7878 | 2f4c | 504f | 626a | 6563 | 745f | 6462 | 2e68 | 7878 | 005f | 5f30 | 7468 | 6973 |
| 2325460 | 3a72 | 2830 | 2c39 | 3529 | 005f | 5f30 | 7468 | 6973 | 203a | 5a74 | 6c00 | 5f5f | 3073 | 203a | 5a74 | 6c00 | 6578 | 706c | 6169 | 6e5f | 5f38 | 4c50 | 4f62 | 6a65 |
| 2325540 | 6374 | 4650 | 6320 | 3a5a | 7446 | 0073 | 6574 | 5072 | 6f70 | 5f5f | 374e | 4f62 | 6a65 | 6374 | 4650 | 6366 | 3a66 | 2830 | 2c32 | 2900 | 5f5f | 3074 | 6869 | 733a |
| 2325620 | 7028 | 302c | 3738 | 2900 | 5f5f | 315f | 5f41 | 3336 | 3a70 | 2830 | 2c33 | 3129 | 005f | 5f31 | 5f5f | 4133 | 373a | 7028 | 302c | 3130 | 2900 | 2f68 | 6f6d | 652f |
| 2325700 | 6f73 | 6173 | 312f | 612f | 6162 | 2f73 | 7263 | 2f6e | 6577 | 6f62 | 6a65 | 6374 | 732f | 6878 | 782f | 4e4f | 626a | 6563 | 745f | 6462 | 2e68 | 7878 | 005f | 5f30 |
| 2325760 | 7468 | 6973 | 203a | 5a74 | 6c00 | 5f5f | 315f | 5f41 | 3336 | 203a | 5a74 | 6c00 | 5f5f | 315f | 5f41 | 3337 | 203a | 5a74 | 6c00 | 7365 | 7450 | 726f | 705f | 5f37 |
| 2326040 | 4e4f | 626a | 6563 | 7446 | 5063 | 6620 | 3a5a | 7446 | 0073 | 6574 | 5072 | 6f70 | 5f5f | 374e | 4f62 | 6a65 | 6374 | 4650 | 6369 | 3a66 | 2830 | 2c32 | 2900 | 5f5f |
| 2326120 | 3074 | 6869 | 733a | 7028 | 302c | 3738 | 2900 | 5f5f | 315f | 5f41 | 3334 | 3a70 | 2830 | 2c33 | 3129 | 005f | 5f31 | 5f5f | 4133 | 353a | 7028 | 302c | 3129 | 005f |
| 2326200 | 5f30 | 7468 | 6973 | 203a | 5a74 | 6c00 | 5f5f | 315f | 5f41 | 3334 | 203a | 5a74 | 6c00 | 5f5f | 315f | 5f41 | 3335 | 203a | 5a74 | 6c00 | 7365 | 7450 | 726f | 705f |
| 2326260 | 5f37 | 4e4f | 626a | 6563 | 7446 | 5063 | 6920 | 3a5a | 7446 | 0073 | 6574 | 5072 | 6f70 | 5f5f | 374e | 4f62 | 6a65 | 6374 | 4650 | 6354 | 313a | 6628 | 302c | 3229 |
| 2326340 | 005f | 5f30 | 7468 | 6973 | 3a70 | 2830 | 2c37 | 3829 | 005f | 5f31 | 5f5f | 4133 | 323a | 7028 | 302c | 3331 | 2900 | 5f5f | 315f | 5f41 | 3333 | 3a70 | 2830 | 2c33 |
| 2326420 | 3129 | 005f | 5f30 | 7468 | 6973 | 203a | 5a74 | 6c00 | 5f5f | 315f | 5f41 | 3332 | 203a | 5a74 | 6c00 | 5f5f | 315f | 5f41 | 3333 | 203a | 5a74 | 6c00 | 7365 | 7450 |
| 2326500 | 726f | 705f | 5f37 | 4e4f | 626a | 6563 | 7446 | 5063 | 5431 | 203a | 5a74 | 4600 | 6765 | 7450 | 726f | 705f | 5f37 | 4e4f | 626a | 6563 | 7446 | 5063 | 693a | 6628 |
| 2326560 | 302c | 3331 | 2900 | 5f5f | 3074 | 6869 | 733a | 7028 | 302c | 3738 | 2900 | 5f5f | 305f | 5f41 | 3330 | 3a70 | 2830 | 2c33 | 3129 | 005f | 5f30 | 5f5f | 4133 | 313a |
| 2326640 | 7028 | 302c | 3129 | 005f | 5f30 | 7468 | 6973 | 203a | 5a74 | 6c00 | 5f5f | 305f | 5f41 | 3330 | 203a | 5a74 | 6c00 | 5f5f | 305f | 5f41 | 3331 | 203a | 5a74 | 6c00 |
| 2326720 | 6765 | 7450 | 726f | 705f | 5f37 | 4e4f | 626a | 6563 | 7446 | 5063 | 6920 | 3a5a | 7446 | 0067 | 6574 | 4174 | 7472 | 5f5f | 374e | 4f62 | 6a65 | 6374 | 4669 | 3a66 |
| 2327000 | 2830 | 2c33 | 3129 | 005f | 5f30 | 7468 | 6973 | 3a70 | 2830 | 2c37 | 3829 | 005f | 5f30 | 5f5f | 4132 | 393a | 7028 | 302c | 3129 | 005f | 5f30 | 7468 | 6973 | 203a |
| 2327060 | 5a74 | 6c00 | 5f5f | 305f | 5f41 | 3239 | 203a | 5a74 | 6c00 | 6765 | 7441 | 7474 | 725f | 5f37 | 4e4f | 626a | 6563 | 7446 | 6920 | 3a5a | 7446 | 0069 | 6e4f | 7264 |
| 2327140 | 6572 | 5f5f | 364f | 626a | 6563 | 7446 | 5036 | 4f62 | 6a65 | 6374 | 3a66 | 2830 | 2c31 | 2900 | 5f5f | 3074 | 6869 | 733a | 7028 | 302c | 3932 | 2900 | 5f5f | 305f |
| 2327220 | 5f41 | 3237 | 3a70 | 2830 | 2c39 | 3229 | 002f | 686f | 6d65 | 2f6f | 7361 | 7331 | 2f61 | 2f61 | 622f | 7372 | 632f | 6e65 | 776f | 626a | 6563 | 7473 | 2f68 | 7878 |
| 2327300 | 2f4f | 626a | 6563 | 745f | 6462 | 2e69 | 7878 | 005f | 5f30 | 7468 | 6973 | 203a | 5a74 | 6c00 | 5f5f | 305f | 5f41 | 3237 | 203a | 5a74 | 6c00 | 696e | 4f72 | 6465 |
| 2327360 | 725f | 5f36 | 4f62 | 6a65 | 6374 | 4650 | 364f | 626a | 6563 | 7420 | 3a5a | 7446 | 0061 | 7474 | 7269 | 6275 | 7465 | 2e6f | 005f | 7365 | 7450 | 726f | 705f | 5f37 |
| 2327440 | 4e4f | 626a | 6563 | 7446 | 5063 | 6600 | 5f73 | 6574 | 5072 | 6f70 | 5f5f | 374e | 4f62 | 6a65 | 6374 | 4650 | 6369 | 005f | 6578 | 706c | 6169 | 6e5f | 5f31 | 3662 |
| 2327520 | 6c6f | 636b | 5f61 | 7474 | 7269 | 6275 | 7465 | 7346 | 5063 | 005f | 6765 | 7441 | 7474 | 725f | 5f37 | 4e4f | 626a | 6563 | 7446 | 6900 | 5f70 | 7574 | 5f5f | 376f |
| 2327600 | 7374 | 7265 | 6163 | 4563 | 005f | 7365 | 7450 | 726f | 705f | 5f37 | 4e4f | 626a | 6563 | 7446 | 5063 | 5431 | 005f | 696f | 7374 | 7265 | 616d | 5f69 | 6e69 | 7400 |
| 2327660 | 5f69 | 734c | 5445 | 5f5f | 374e | 4f62 | 6a65 | 6374 | 4650 | 364f | 626a | 6563 | 7400 | 5f69 | 7347 | 5445 | 5f5f | 374e | 4f62 | 6a65 | 6374 | 4650 | 364f | 626a |
| 2327740 | 6563 | 7400 | 5f65 | 7870 | 6c61 | 696e | 5f5f | 384c | 504f | 626a | 6563 | 7446 | 5063 | 005f | 6765 | 7450 | 726f | 705f | 5f37 | 4e4f | 626a | 6563 | 7446 | 5063 |
| 2330020 | 6900 | 5f69 | 6e4f | 7264 | 6572 | 5f5f | 364f | 626a | 6563 | 7446 | 5036 | 4f62 | 6a65 | 6374 | 002f | 686f | 6d65 | 2f6f | 7361 | 7331 | 2f61 | 2f61 | 622f | 7372 |
| 2330100 | 632f | 6e65 | 776f | 626a | 6563 | 7473 | 2f70 | 726f | 672f | 432b | 2b2e | 3139 | 3133 | 392f | 0061 | 7474 | 7269 | 6275 | 7465 | 2e63 | 0061 | 7474 | 7269 | 6275 |
| 2330160 | 7465 | 2e63 | 7878 | 0069 | 6e74 | 3a74 | 2830 | 2c31 | 2931 | 7228 | 302c | 3129 | 3b2d | 3231 | 3437 | 3438 | 3336 | 3438 | 3b32 | 3134 | 3734 | 3833 | 3634 | 373b |
| 2330240 | 0063 | 6861 | 723a | 7428 | 302c | 3229 | 3d72 | 2830 | 2c32 | 293b | 303b | 3132 | 373b | 006c | 6f6e | 673a | 7428 | 302c | 3329 | 3d72 | 2830 | 2c31 | 293b | 2d32 |
| 2330320 | 3134 | 3734 | 3833 | 3634 | 383b | 3231 | 3437 | 3438 | 3336 | 3437 | 3b00 | 7368 | 6f72 | 743a | 7428 | 302c | 3429 | 3d72 | 2830 | 2c31 | 293b | 2d33 | 3237 | 3638 |
| 2330400 | 3b33 | 3237 | 3637 | 3b00 | 756e | 7369 | 676e | 6564 | 2063 | 6861 | 723a | 7428 | 302c | 3529 | 3d72 | 2830 | 2c31 | 293b | 303b | 3235 | 353b | 0075 | 6e73 | 6967 |
| 2330460 | 6e65 | 6420 | 7368 | 6f72 | 743a | 7428 | 302c | 3629 | 3d72 | 2830 | 2c31 | 293b | 303b | 3635 | 3533 | 353b | 0075 | 6e73 | 6967 | 6e65 | 6420 | 6c6f | 6e67 | 3a74 |
| 2330540 | 2830 | 2c37 | 293d | 7228 | 302c | 3129 | 3b30 | 3b2d | 313b | 0075 | 6e73 | 6967 | 6e65 | 6420 | 696e | 743a | 7428 | 302c | 3829 | 3d72 | 2830 | 2c31 | 293b | 303b |
| 2330620 | 2d31 | 3b00 | 666c | 6f61 | 743a | 7428 | 302c | 3929 | 3d72 | 2830 | 2c31 | 293b | 343b | 303b | 0064 | 6f75 | 626c | 653a | 7428 | 302c | 3130 | 293d | 7228 | 302c |
| 2330700 | 3129 | 3b38 | 3b30 | 3b00 | 766f | 6964 | 3a74 | 2830 | 2c31 | 3129 | 3d28 | 302c | 3131 | 2900 | 3f3f | 3f3a | 7428 | 302c | 3132 | 293d | 2830 | 2c31 | 2900 | 5f5f |
| 2330760 | 7670 | 7470 | 3a74 | 2830 | 2c31 | 3329 | 3d2a | 2830 | 2c31 | 3429 | 3d56 | 2830 | 2c31 | 2900 | 5f5f | 6d70 | 7472 | 3a54 | 2830 | 2c31 | 3529 | 3d73 | 3864 | 3a28 |
| 2331040 | 302c | 3429 | 2c30 | 2c31 | 363b | 693a | 2830 | 2c34 | 292c | 3136 | 2c31 | 363b | 663a | 2830 | 2c31 | 3329 | 2c33 | 322c | 3332 | 3b3b | 005f | 5046 | 565f | 3a74 |
| 2331120 | 2830 | 2c31 | 3629 | 312a | 2830 | 2c31 | 3729 | 3d66 | 2830 | 2c32 | 2900 | 5f50 | 4649 | 5f3a | 7428 | 302c | 3133 | 2900 | 7374 | 7265 | 616d | 706f | 733a | 7428 |
| 2331200 | 302c | 3129 | 0073 | 7472 | 6561 | 6d6f | 6666 | 3a74 | 2830 | 2c31 | 2900 | 696f | 5f73 | 7461 | 7465 | 3a54 | 2830 | 2c31 | 3829 | 3d65 | 676f | 6f64 | 6269 | 745f |
| 2331260 | 5f69 | 6f5f | 7374 | 6174 | 653a | 302c | 656f | 6662 | 6974 | 5f5f | 696f | 5f73 | 7461 | 7465 | 3a31 | 2c66 | 6169 | 6c62 | 6974 | 5f5f | 696f | 5f73 | 7461 | 7465 |
| 2331340 | 3a32 | 2c62 | 6164 | 6269 | 745f | 5f69 | 6f5f | 7374 | 6174 | 653a | 332c | 6861 | 7264 | 6661 | 696c | 5f5f | 696f | 5f73 | 7461 | 7465 | 3a34 | 2c3b | 006f | 7065 |
| 2331420 | 6e5f | 6d6f | 6465 | 3a54 | 2830 | 2c31 | 3929 | 3d65 | 696e | 5f5f | 6f70 | 656e | 5f6d | 6f64 | 653a | 302c | 6f75 | 745f | 5f6f | 7065 | 6e5f | 6d6f | 6465 | 3a31 |
| 2331500 | 2c61 | 7465 | 5f5f | 6f70 | 656e | 5f6d | 6f64 | 653a | 322c | 6170 | 705f | 5f6f | 7065 | 6e5f | 6d6f | 6465 | 3a33 | 2c74 | 7275 | 6e63 | 5f5f | 6f70 | 656e | 5f6d |
| 2331560 | 6f64 | 653a | 342c | 6e6f | 6372 | 6561 | 7465 | 5f5f | 6f70 | 656e | 5f6d | 6f64 | 653a | 352c | 6e6f | 7265 | 706c | 6163 | 655f | 5f6f | 7065 | 6e5f | 6d6f | 6465 |
| 2331640 | 3a36 | 2c3b | 0073 | 6565 | 6b5f | 6469 | 723a | 5428 | 302c | 3230 | 293d | 6562 | 6567 | 5f5f | 7365 | 656b | 5f64 | 6972 | 3a30 | 2c63 | 7572 | 5f5f | 7365 | 656b |
| 2331720 | 5f64 | 6972 | 3a31 | 2c65 | 6e64 | 5f5f | 7365 | 656b | 5f64 | 6972 | 3a32 | 2c3b | 005f | 5f45 | 313a | 5428 | 302c | 3231 | 293d | 6573 | 6b69 | 7077 | 735f | 5f5f |
| 2332000 | 5f45 | 313a | 302c | 6c65 | 6674 | 5f5f | 5f5f | 4531 | 3a31 | 2c72 | 6967 | 6874 | 5f5f | 5f5f | 4531 | 3a32 | 2c69 | 6e74 | 6572 | 6e61 | 6c5f | 5f5f | 5f45 | 313a |
| 2332060 | 332c | 6465 | 635f | 5f5f | 5f45 | 313a | 342c | 6f63 | 745f | 5f5f | 5f45 | 313a | 352c | 6865 | 785f | 5f5f | 5f45 | 313a | 362c | 7368 | 6f77 | 6261 | 7365 | 5f5f |
| 2332140 | 5f5f | 4531 | 3a37 | 2c5c | 0073 | 686f | 7770 | 6f69 | 6e74 | 5f5f | 5f5f | 4531 | 3a38 | 2c75 | 7070 | 6572 | 6361 | 7365 | 5f5f | 5f5f | 4531 | 3a39 | 2c73 | 686f |
| 2332220 | 7770 | 6f73 | 5f5f | 5f5f | 4531 | 3a31 | 302c | 7363 | 6965 | 6e74 | 6966 | 6963 | 5f5f | 5f5f | 4531 | 3a31 | 312c | 6669 | 7865 | 645f | 5f5f | 5f45 | 313a | 3132 |
| 2332300 | 2c75 | 6e69 | 7462 | 7566 | 5f5f | 5f5f | 4531 | 3a31 | 332c | 7374 | 6469 | 6f5f | 5f5f | 5f45 | 313a | 3134 | 2c3b | 005f | 5f45 | 323a | 5428 | 302c | 3232 | 293d |
| 2332360 | 6573 | 6b69 | 7070 | 696e | 675f | 5f5f | 5f45 | 323a | 302c | 7469 | 6564 | 5f5f | 5f5f | 4532 | 3a31 | 2c3b | 0069 | 6f73 | 3a54 | 2830 | 2c32 | 3329 | 3d73 | 3630 |

```
2332440  6e75 7365 725f 5f33 696f 733a 2830 2c31 292c 302c 3332 3b78 5f75 7365 725f 5f33 696f 733a 2830 2c32 3729 3d2a 2830 2c32
2332520  3429 3d78 7569 6f73 5f75 7365 725f 756e 696f 6e3a 2c33 322c 3332 3b62 705f 5f33 696f 733a 2830 2c32 3829 3d2a 2830 2c32
2332600  3529 3d78 7373 7472 6561 6d62 7566 3a2c 3634 2c33 323b 7374 6174 655f 5f33 696f 733a 2830 2c31 292c 3936 2c33 323b 6973
2332660  7065 6369 616c 5f5f 3369 6f73 3a28 302c 3129 2c31 3238 2c33 323b 6f73 7065 6369 616c 5f5f 3369 6f73 3a28 302c 3129 2c31
2332740  3630 2c33 323b 6973 6678 5f73 7065 6369 616c 5f5f 3369 6f73 3a28 302c 3129 2c31 3932 2c33 323b 6f73 6678 5f73 7065 6369
2333020  616c 5f5f 3369 6f73 3a28 302c 3129 2c32 3234 2c33 323b 5c00 6465 6c62 7566 5f5f 3369 6f73 3a28 302c 3129 2c32 3536 2c33
2333100  323b 785f 7469 655f 5f33 696f 733a 2830 2c32 3929 342a 2830 2c32 3629 3d78 736f 7374 7265 616d 3a2c 3238 382c 3332 3b78
2333160  5f66 6c61 6773 5f5f 3369 6f73 3a28 302c 3129 2c33 3230 2c33 323b 785f 7072 6563 6973 696f 6e5f 5f33 696f 733a 2830 2c34
2333240  292c 3335 322c 3136 3b78 5f66 696c 6c5f 5f33 696f 733a 2830 2c32 292c 3336 382c 383b 785f 7769 6474 685f 5f33 696f 733a
2333320  2830 2c34 292c 3338 342c 3136 3b61 7373 6967 6e5f 7072 6976 6174 655f 5f33 696f 733a 2830 2c31 292c 3431 362c 3332 3b5f
2333400  5f76 7074 725f 5f33 696f 733a 2830 2c33 3029 3d2a 2830 2c31 3529 2c34 3438 2c33 323b 3b00 6261 7365 6669 656c 645f 5f33
2333460  696f 733a 4728 302c 3129 0061 646a 7573 7466 6965 6c64 5f5f 3369 6f73 3a47 2830 2c31 2900 666c 6f61 7466 6965 6c64 5f5f
2333540  3369 6f73 3a47 2830 2c31 2900 6e65 7874 6269 745f 5f33 696f 733a 4728 302c 3129 006e 6578 7477 6f72 645f 5f33 696f 733a
2333620  4728 302c 3129 0073 7464 696f 666c 7573 685f 5f33 696f 733a 4728 302c 3136 2900 696f 733a 5a63 696f 733b 3b5f 5f63 745f
2333700  5f33 696f 7346 5039 7374 7265 616d 6275 6620 5f5f 6374 5f5f 3369 6f73 4676 205f 5f63 745f 5f33 696f 7346 5233 696f 7320
2333760  5f5f 6474 5f5f 3369 6f73 4676 2066 6c61 5773 5f5f 3369 6f73 4676 2066 6c61 6773 5f5f 3369 6f73 466c 2073 6574 665f 5f33
2334040  696f 7346 6c54 3120 7365 7466 5f5f 3369 6f73 466c 2075 6e73 6574 665f 5f33 696f 7346 6c20 7769 6474 685f 5f33 696f 7346
2334120  7620 7769 6474 685f 5f33 696f 7346 6920 7469 655f 5f33 696f 7346 5037 6f73 7472 6561 6d20 5c00 7469 655f 5f33 696f 7346
2334200  7620 6669 6c6c 5f5f 3369 6f73 4663 2066 696c 6c5f 5f33 696f 7346 7620 7072 6563 6973 696f 6e5f 5f33 696f 7346 6920 7072
2334260  6563 6973 696f 6e5f 5f33 696f 7346 7620 7264 7374 6174 655f 5f33 696f 7346 7620 5f5f 6f70 5076 5f5f 3369 6f73 4676 205f
2334340  5f6e 745f 5f33 696f 7346 7620 656f 665f 5f33 696f 7346 7620 6661 696c 5f5f 3369 6f73 4676 2062 6164 5f5f 3369 6f73 4676
2334420  2067 6f6f 645f 5f33 696f 7346 7620 636c 6561 725f 5f33 696f 7346 6920 7264 6275 665f 5f33 696f 7346 7620 5c00 6977 6f72
2334500  645f 5f33 696f 7346 6920 7377 6f72 645f 5f33 696f 7346 6920 6269 7461 6c6c 6f63 5f5f 3369 6f73 5346 7620 7861 6c6c 6f63
2334560  5f5f 3369 6f73 5346 7620 7572 6573 697a 655f 5f33 696f 7346 6920 7379 6e63 5f77 6974 685f 7374 6469 6f5f 5f33 696f 7353
2334640  4676 2073 6574 7374 6174 655f 5f33 696f 7346 6920 6974 5f5f 3369 6f73 4650 3973 7472 6561 6d62 7566 205f 5f61 735f
2334720  5f33 696f 7346 5233 696f 7320 736b 6970 5f5f 3369 6f73 4669 203b 6261 7365 6669 656c 645f 5f33 696f 7320 5c00 6164 6a75
2335000  7374 6669 656c 645f 5f33 696f 7320 666c 6f61 7466 6965 6c64 5f5f 3369 6f73 206e 6578 7462 6974 5f5f 3369 6f73 206e 6578
2335060  7477 6f72 645f 5f33 696f 7320 7374 6469 6f66 6c75 7368 5f5f 3369 6f73 203b 3b00 7374 7265 616d 6275 663a 5428 302c 3235
2335140  293d 7334 3061 6c6c 6f63 5f5f 3973 7472 6561 6d62 7566 3a28 302c 3429 2c30 2c31 363b 785f 756e 6275 665f 5f39 7374 7265
2335220  616d 6275 663a 2830 2c34 292c 3136 2c31 363b 785f 6261 7365 5f5f 3973 7472 6561 6d62 7566 3a28 302c 3331 293d 2a28 302c
2335300  3229 2c33 322c 3332 3b78 5f70 6261 7365 5f5f 3973 7472 6561 6d62 7566 3a28 302c 3331 292c 3634 2c33 323b 705f 7070 7472
2335360  5f5f 3973 7472 6561 6d62 7566 3a28 302c 3331 292c 3936 2c33 323b 785f 6570 7074 725f 5f39 7374 7265 616d 6275 663a 2830
2335440  2c33 3129 2c31 3238 2c33 323b 795f 6770 7472 5f5f 3973 7472 6561 6d62 7566 3a28 302c 3331 292c 3136 302c 3332 3b78 5f65
2335520  6770 7472 5f5f 3973 7472 6561 6d62 7566 3a28 302c 3331 292c 3139 322c 3332 3b5c 0078 5f65 6261 636b 5f5f 3973 7472 6561
2335600  6d62 7566 3a28 302c 3331 292c 3232 342c 3332 3b78 5f62 6c65 6e5f 5f39 7374 7265 616d 6275 663a 2830 2c31 292c 3235 362c
2335660  3332 3b5f 5f76 7074 725f 5f39 7374 7265 616d 6275 663a 2830 2c33 3029 2c32 3838 2c33 323b 3b00 7374 7265 616d 6275 663a
2335740  5a63 7374 7265 616d 6275 663b 3b5f 5f63 745f 5f39 7374 7265 616d 6275 6646 5239 7374 7265 616d 6275 6620 5f5f 6374 5f5f
2336020  3973 7472 6561 6d62 7566 4676 205f 5f63 745f 5f39 7374 7265 616d 6275 6646 5063 6920 5f5f 6374 5f5f 3973 7472 6561 6d62
2336100  7566 4650 6369 5432 205f 5f61 735f 5f39 7374 7265 616d 6275 6646 5239 7374 7265 616d 6275 6620 6462 705f 5f39 7374 7265
2336160  616d 6275 6646 7620 6261 7365 5f5f 3973 7472 6561 6d62 7566 4676 2070 6261 7365 5f5f 3973 7472 6561 6d62 7566 4676 205c
2336240  0070 7074 725f 5f39 7374 7265 616d 6275 6646 7620 6570 7074 725f 5f39 7374 7265 616d 6275 6646 7620 6770 7472 5f5f 3973
2336320  7472 6561 6d62 7566 4676 2065 6770 7472 5f5f 3973 7472 6561 6d62 7566 4676 2065 6261 636b 5f5f 3973 7472 6561 6d62 7566
2336400  4676 2065 6275 665f 5f39 7374 7265 616d 6275 6646 7620 626c 656e 5f5f 3973 7472 6561 6d62 7566 4676 2073 6574 705f 5f39
2336460  7374 7265 616d 6275 6646 5063 5431 2073 6574 675f 5f39 7374 7265 616d 6275 6646 5063 4e32 3120 7062 756d 705f 5f39 7374
2336540  7265 616d 6275 6646 6920 5c00 6762 756d 705f 5f39 7374 7265 616d 6275 6646 6920 7365 7462 5f5f 3973 7472 6561 6d62 7566
2336620  4650 6354 3169 2075 6e62 7566 6665 7265 645f 5f39 7374 7265 616d 6275 6646 7620 756e 6275 6666 6572 6564 5f5f 3973 7472
2336700  6561 6d62 7566 4669 2061 6c6c 6f63 6174 655f 5f39 7374 7265 616d 6275 6646 7620 646f 616c 6c6f 6361 7465 5f5f 3973 7472
2336760  6561 6d62 7566 4676 206f 7665 7266 6c6f 775f 5f39 7374 7265 616d 6275 6646 6920 756e 6465 7266 6c6f 775f 5f39 7374 7265
2337040  616d 6275 6646 7620 5c00 7062 6163 6b66 6169 6c5f 5f39 7374 7265 616d 6275 6646 6920 7379 6e63 5f5f 3973 7472 6561 6d62
2337120  7566 4676 2073 6565 6b6f 6666 5f5f 3973 7472 6561 6d62 7566 466c 3873 6565 6b5f 6469 7269 2073 6565 6b70 6f73 5f5f 3973
2337200  7472 6561 6d62 7566 466c 6920 7873 7075 746e 5f5f 3973 7472 6561 6d62 7566 4650 4363 6920 7873 6765 746e 5f5f 3973 7472
2337260  6561 6d62 7566 4650 6369 2069 6e5f 6176 6169 6c5f 5f39 7374 7265 616d 6275 6646 7620 6f75 745f 7761 6974 696e 675f 5f39
2337340  7374 7265 616d 6275 6646 7620 5c00 7367 6574 635f 5f39 7374 7265 616d 6275 6646 7620 736e 6578 7463 5f5f 3973 7472 6561
2337420  6d62 7566 4676 2073 6275 6d70 635f 5f39 7374 7265 616d 6275 6646 7620 7374 6f73 7363 5f5f 3973 7472 6561 6d62 7566 4676
2337500  2073 7075 7462 6163 6b63 5f5f 3973 7472 6561 6d62 7566 4663 2073 7075 7463 5f5f 3973 7472 6561 6d62 7566 4669 2073 7075
```

```
2337560  746e 5f5f 3973 7472 6561 6d62 7566 4650 4363 6920 7367 6574 6e5f 5f39 7374 7265 616d 6275 6646 5063 6920 7365 7462 7566
2337640  5f5f 3973 7472 6561 6d62 7566 4650 6369 205c 0073 6574 6275 665f 5f39 7374 7265 616d 6275 6646 5055 6369 2073 6574 6275
2337720  665f 5f39 7374 7265 616d 6275 6646 5063 6954 3220 5f5f 6474 5f5f 3973 7472 6561 6d62 7566 4676 2078 5f73 6e65 7874 635f
2340000  5f39 7374 7265 616d 6275 6646 7620 3b3b 3b00 6973 7472 6561 613a 5428 302c 3332 293d 7337 3278 5f67 636f 756e 745f 5f37
2340060  6973 7472 6561 6d3a 2830 2c31 292c 302c 3332 3b5f 5f76 7074 725f 5f37 6973 7472 6561 6d3a 2030 2c33 3029 2c33 322c 3332
2340140  3b50 696f 733a 2930 2c33 3329 312a 2830 2c32 3329 2c36 342c 3332 3b4f 696f 733a 2830 2c32 3329 2c39 362c 3438 303b 3b00
2340220  6973 7472 6561 6d3a 5a63 6973 7472 6561 6d3b 696f 733b 5f5f 6374 5f5f 3769 7374 7265 616d 4650 3973 7472 6561 6d62 7566
2340300  205f 5f63 745f 5f37 6973 7472 6561 6d46 7620 5f5f 6374 5f5f 3769 7374 7265 616d 4650 3973 7472 6561 6d62 7566 6950 376f
2340360  7374 7265 616d 205f 5f63 745f 5f37 6973 7472 6561 6d46 6950 6354 3120 5f5f 6374 5f5f 3769 7374 7265 616d 4669 5431 5037
2340440  6f73 7472 6561 6120 5f5f 6374 5f5f 3769 7374 7265 616d 4652 3769 7374 7265 616d 205f 5f64 745f 5f37 6973 7472 6561 6d46
2340520  7620 5c00 6970 6678 5f5f 3769 7374 7265 616d 4669 2069 7366 785f 5f37 6973 7472 6561 6d46 7620 7365 656b 675f 5f37 6973
2340600  7472 6561 6d46 6c20 7365 656b 675f 5f37 6973 7472 6561 6d46 6c38 7365 656b 5f64 6972 2074 656c 6c67 5f5f 3769 7374 7265
2340660  616d 4676 205f 5f72 735f 5f37 6973 7472 6561 6d46 5046 5237 6973 7472 6561 6d5f 5237 6973 7472 6561 6d20 5f5f 7273 5f5f
2340740  3769 7374 7265 616d 4650 4652 3369 6f73 5f52 3369 6f73 205f 5f72 735f 5f37 6973 7472 6561 6d46 5063 205f 5f72 735f 5f37
2341020  6973 7472 6561 6d46 5055 6320 5c00 5f5f 7273 5f5f 3769 7374 7265 616d 4652 5563 205f 5f72 735f 5f37 6973 7472 6561 6d46
2341100  5263 205f 5f72 735f 5f37 6973 7472 6561 6d46 5273 205f 5f72 735f 5f37 6973 7472 6561 6d46 5269 205f 5f72 735f 5f37 6973
2341160  7472 6561 6d46 526c 205f 5f72 735f 5f37 6973 7472 6561 6d46 5255 7320 5f5f 7273 5f5f 3769 7374 7265 616d 4652 5569 205f
2341240  5f72 735f 5f37 6973 7472 6561 6d46 5255 6c20 5f5f 7273 5f5f 3769 7374 7265 616d 4652 6620 5f5f 7273 5f5f 3769 7374 7265
2341320  616d 4652 6420 5f5f 7273 5f5f 3769 7374 7265 616d 4650 3973 7472 6561 6d62 7566 205c 0067 6574 5f5f 3769 7374 7265 616d
2341400  4650 6369 6320 6765 745f 5f37 6973 7472 6561 6d46 5055 6369 6320 6765 745f 5f37 6973 7472 6561 6d46 5239 7374 7265 616d
2341460  6275 6663 2067 6574 5f5f 3769 7374 7265 616d 4652 5563 2067 6574 5f5f 3769 7374 7265 616d 4652 6320 6765 745f 5f37 6973
2341540  7472 6561 6d46 7620 6765 746c 696e 655f 5f37 6973 7472 6561 6d46 5063 6963 2067 6574 6c69 6e65 5f5f 3769 7374 7265 616d
2341620  4650 5563 6963 2070 6565 6b5f 5f37 6973 7472 6561 6d46 7620 6967 6e6f 7265 5f5f 3769 7374 7265 616d 4669 5431 205c 0072
2341700  6561 645f 5f37 6973 7472 6561 6d46 5063 6920 7265 6164 5f5f 3769 7374 7265 616d 4650 5563 6920 6763 6f75 6e74 5f5f 3769
2341760  7374 7265 616d 4676 2070 7574 6261 636b 5f5f 3769 7374 7265 616d 4663 2073 796e 635f 5f37 6973 7472 6561 6d46 7620 646f
2342040  5f69 7066 785f 5f37 6973 7472 6561 6d46 6920 6561 7477 6869 7465 5f5f 3769 7374 7265 616d 4676 2078 6765 745f 5f37 6973
2342120  7472 6561 6d46 5063 203b 3b3b 006f 7374 7265 616d 3a54 2830 2c32 3629 3d73 3638 5f5f 7670 7472 5f5f 376f 7374 7265 616d
2342200  3a28 302c 3330 292c 302c 3332 3b50 696f 733a 2830 2c33 3329 2c33 322c 3332 3b4f 696f 733a 2830 2c32 3329 2c36 342c 3438
2342260  303b 3b0c 6f73 7472 6561 6d3a 5a63 6f73 7472 6561 6d3b 696f 733b 5f5f 6374 5f5f 376f 7374 7265 616d 4650 3973 7472 6561
2342340  6d62 7566 205f 5f63 745f 5f37 6f73 7472 6561 6d46 7620 5f5f 6374 5f5f 376f 7374 7265 616d 4669 205f 5f63 745f 5f37 6f73
2342420  7472 6561 6d46 6950 6320 5f5f 6374 5f5f 376f 7374 7265 616d 4652 376f 7374 7265 616d 205f 5f64 745f 5f37 6f73 7472 6561
2342500  6d46 7620 6f70 6678 5f5f 376f 7374 7265 616d 4676 206f 7366 785f 5f37 6f73 7472 6561 6d46 7620 666c 7573 685f 5f37 6f73
2342560  7472 6561 6d46 7620 5c00 7365 656b 705f 5f37 6f73 7472 6561 6d46 6c20 7365 656b 705f 5f37 6f73 7472 6561 6d46 6c38 7365
2342640  656b 5f64 6972 2074 656c 6c70 5f5f 376f 7374 7265 616d 4676 2070 7574 5f5f 376f 7374 7265 616d 4663 205f 5f6c 735f 5f37
2342720  6f73 7472 6561 6d46 6320 5f5f 6c73 5f5f 376f 7374 7265 616d 4655 6320 5f5f 6c73 5f5f 376f 7374 7265 616d 4650 4363 205f
2343000  5f6c 735f 5f37 6f73 7472 6561 6d46 6920 5f5f 6c73 5f5f 376f 7374 7265 616d 466c 205f 5f6c 735f 5f37 6f73 7472 6561 6d46
2343060  6420 5f5f 6c73 5f5f 376f 7374 7265 616d 4666 205c 005f 5f6c 735f 5f37 6f73 7472 6561 6d46 5569 205f 5f6c 735f 5f37 6f73
2343140  7472 6561 6d46 556c 205f 5f6c 735f 5f37 6f73 7472 6561 6d46 5076 205f 5f6c 735f 5f37 6f73 7472 6561 6d46 5039 7374 7265
2343220  616d 6275 6620 5f5f 6c73 5f5f 376f 7374 7265 616d 4673 205f 5f6c 735f 5f37 6f73 7472 6561 6d46 5573 205f 5f6c 735f 5f37
2343300  6f73 7472 6561 6d46 5046 5237 6f73 7472 6561 645f 5237 6f73 7472 6561 6d20 5f5f 6c73 5f5f 376f 7374 7265 616d 4650 4652
2343360  3369 6f73 5f52 3369 6f73 2077 7269 7465 5f5f 376f 7374 7265 616d 4650 4363 6920 5c00 7772 6974 655f 5f37 6f73 7472 6561
2343440  6d46 5043 5563 6920 646f 5f6f 7066 785f 5f37 6f73 7472 6561 6d46 7620 646f 5f6f 7366 785f 5f37 6f73 7472 6561 6d46 7620
2343520  3b3b 3b00 7075 745f 5f37 6f73 7472 6561 6d46 633a 6628 302c 3334 293d 2a28 302c 3236 2900 5f5f 3074 6869 733a 7028 302c
2343600  3334 2900 5f5f 3063 3a70 2830 2c32 2900 2f75 7372 2f43 432f 7375 6e34 2f69 6e63 6c2f 696f 7374 7265 616d 2e68 005f 5f30
2343660  7468 6973 3a72 2830 2c33 3429 005f 5f30 7468 6973 203a 5a74 6c00 5f5f 3063 203a 5a74 6c00 7075 745f 5f37 6f73 7472 6561
2343740  6d46 6320 3a5a 7446 0069 6f73 7472 6561 6d3a 5428 302c 3335 293d 7338 3078 5f67 636f 756e 745f 5f37 6973 7472 6561 6d3a
2344020  2830 2c31 292c 302c 3332 3b5f 5f76 7074 725f 5f37 6973 7472 6561 6d3a 2830 2c33 3029 2c33 322c 3332 3b50 696f 733a 2830
2344100  2c33 3329 2c36 342c 3332 3b4f 6f73 7472 6561 6d3a 2830 2c32 3629 2c39 362c 3534 343b 3b00 696f 7374 7265 616d 3a5a 6369
2344160  6f73 7472 6561 613b 6973 7472 6561 6d20 6f73 7472 6561 6d20 696f 733b 5f5f 6374 5f5f 3869 6f73 7472 6561 6d46 5039 7374
2344240  7265 616d 6275 6620 5f5f 6374 5f5f 3869 6f73 7472 6561 6d46 7620 5f5f 6374 5f5f 3869 6f73 7472 6561 6d46 5238 696f 7374
2344320  7265 616d 205f 5f64 745f 5f38 696f 7374 7265 616d 4676 203b 3b3b 0063 696e 3a47 2830 2c33 3629 3d78 7369 7374 7265 616d
2344400  5f77 6974 6861 7373 6967 6e3a 6f75 743a 4728 302c 3337 293d 7873 6f73 7472 6561 6d5f 7769 7468 6173 7369 676e 3a00
2344460  6365 7272 3a47 2830 2c33 3729 0063 6c6f 673a 4728 302c 3337 2900 496f 7374 7265 616d 5f69 6e69 743a 5428 302c 3338 293d
2344540  7331 5f5f 5739 5f5f 3133 496f 7374 7265 616d 5f69 6e69 743a 2830 2c32 292c 302c 383b 3b00 7374 6473 7461 7475 735f 5f31
2344620  3349 6f73 7472 6561 6d5f 696e 6974 3a47 2830 2c31 2900 696e 6974 636f 756e 745f 5f31 3349 6f73 7472 6561 6d5f 696e 6974
```

2344700 3a47 2830 2c31 2900 496f 7374 7265 616d 5f69 6e69 743a 5a63 496f 7374 7265 616d 5f69 6e69 743b 3b5f 5f63 745f 5f31 3349
2344760 6f73 7472 6561 6d5f 696e 6974 4676 205f 5f64 745f 5f31 3349 6f73 7472 6561 6d5f 696e 6974 4676 203b 7374 6473 7461 7475
2345040 735f 5f31 3349 6f73 7472 6561 6d5f 696e 6974 2069 6e69 7463 6f75 6e74 5f5f 3133 496f 7374 7265 616d 5f69 6e69 7420 3b40
2345120 696f 733b 0069 6f73 7472 6561 6d5f 696e 6974 3a53 2830 2c33 3829 0047 5054 3a74 2830 2c31 3329 0073 6d61 6e69 705f 696e
2345200 743a 5428 302c 3339 293d 7338 6663 745f 5f31 3073 6d61 6e69 705f 696e 743a 2830 2c34 3029 3d2a 2830 2c34 3129 3d66 2830
2345260 2c33 3329 2c30 2c33 323b 6172 675f 5f31 3073 6d61 6e69 705f 696e 743a 2830 2c31 292c 3332 2c33 323b 3b00 736d 616e 6970
2345340 5f69 6e74 3a5a 6373 6d61 6e69 705f 696e 743b 3b5f 5f63 745f 5f31 3073 6d61 6e69 705f 696e 7446 5046 5233 696f 7369 5f52
2345420 3369 6f73 6920 3b3b 5f5f 6c73 5f5f 4652 376f 7374 7265 616d 5231 3073 6d61 6e69 705f 696e 7420 5f5f 7273 5f5f 4652 3769
2345500 7374 7265 616d 5231 3073 6d61 6e69 705f 696e 7420 3b00 7361 7070 6c79 5f69 6e74 3a54 2830 2c34 3229 3d73 3466 6374 5f5f
2345560 3130 7361 7070 6c79 5f69 6e74 3a28 302c 3430 292c 302c 3332 3b3b 0073 6170 706c 795f 696e 743a 5a63 7361 7070 6c79 5f69
2345640 6e74 3b3b 5f5f 6374 5f5f 3130 7361 7070 6c79 5f69 6e74 4650 4652 3369 6f73 695f 5233 696f 7320 5f5f 636c 5f5f 3130 7361
2345720 7070 6c79 5f69 6e74 4669 203b 3b3b 0069 6d61 6e69 705f 696e 743a 5428 302c 3433 293d 7338 6663 745f 5f31 3069 6d61 6e69
2346000 705f 696e 743a 2830 2c34 3429 3d2a 2830 2c34 3529 3d66 2830 2c34 3629 3d2a 2830 2c33 3229 2c30 2c33 323b 6172 675f 5f31
2346060 3069 6d61 6e69 705f 696e 743a 2830 2c31 292c 3332 2c33 323b 3b00 6964 616e 6970 5f69 6e74 3a5a 6369 6d61 6e69 705f 696e
2346140 743b 3b5f 5f63 745f 5f31 3069 6d61 6e69 705f 696e 7446 5046 5237 6973 7472 6561 6d69 5f52 3769 7374 7265 616d 6920 3b3b
2346220 5f5f 7273 5f5f 4652 3769 7374 7265 616d 5231 3069 6d61 6e69 705f 696e 7420 3b00 6961 7070 6c79 5f69 6e74 3a54 2830 2c34
2346300 3729 3d73 3466 6374 5f5f 3130 6961 7070 6c79 5f69 6e74 3a28 302c 3434 292c 302c 3332 3b3b 0069 6170 706c 795f 696e 743a
2346360 5a63 6961 7070 6c79 5f69 6e74 3b3b 5f5f 6374 5f5f 3130 6961 7070 6c79 5f69 6e74 4650 4652 3769 7374 7265 616d 695f 5237
2346440 6973 7472 6561 6d20 5f5f 636c 5f5f 3130 6961 7070 6c79 5f69 6e74 4669 203b 3b3b 006f 6d61 6e69 705f 696e 743a 5428 302c
2346520 3438 293d 7338 6663 745f 5f31 306f 6d61 6e69 705f 696e 743a 2830 2c34 3929 3d2a 2830 2c35 3029 3d66 2830 2c33 3429 2c30
2346600 2c33 323b 6172 675f 5f31 306f 6d61 6e69 705f 696e 743a 2830 2c31 292c 3332 2c33 323b 3b00 6f6d 616e 6970 5f69 6e74 3a5a
2346660 636f 6d61 6e69 705f 696e 743b 3b5f 5f63 745f 5f31 306f 6d61 6e69 705f 696e 7446 5046 5237 6f73 7472 6561 6d69 5f52 376f
2346740 7374 7265 616d 6920 3b3b 5f5f 6c73 5f5f 4652 376f 7374 7265 616d 5231 306f 6d61 6e69 705f 696e 7420 3b00 6f61 7070 6c79
2347020 5f69 6e74 3a54 2830 2c35 3129 3d73 3466 6374 5f5f 3130 6f61 7070 6c79 5f69 6e74 3a28 302c 3439 292c 302c 3332 3b3b 006f
2347100 6170 706c 795f 696e 743a 5a63 6f61 7070 6c79 5f69 6e74 3b3b 5f5f 6374 5f5f 3130 6f61 7070 6c79 5f69 6e74 4650 4652 376f
2347160 7374 7265 616d 695f 5237 6f73 7472 6561 6d20 5f5f 636c 5f5f 3130 6f61 7070 6c79 5f69 6e74 4669 203b 3b3b 0069 6f6d 616e
2347240 6970 5f69 6e74 3a54 2830 2c35 3229 3d73 3866 6374 5f5f 3131 696f 6d61 6e69 705f 696e 743a 2830 2c35 3329 3d2a 2830 2c35
2347320 3429 3d66 2830 2c35 3529 3d2a 2830 2c33 3529 2c30 2c33 323b 6172 675f 5f31 3169 6f6d 616e 6970 5f69 6e74 3a28 302c 3129
2347400 2c33 322c 3332 3b3b 0069 6f6d 616e 6970 5f69 6e74 3a5a 6369 6f6d 616e 6970 5f69 6e74 3b3b 5f5f 6374 5f5f 3131 696f 6d61
2347460 6e69 705f 696e 7446 5046 5238 696f 7374 7265 616d 695f 5238 696f 7374 7265 616d 6920 3b3b 5f5f 6c73 5f5f 4652 3869 6f73
2347540 7472 6561 6d52 3131 696f 6d61 6e69 705f 696e 7420 5f5f 7273 5f5f 4652 3869 6f73 7472 6561 6d52 3131 696f 6d61 6e69 705f
2347620 696e 7420 3b00 696f 6170 706c 795f 696e 743a 5428 302c 3536 293d 7334 6663 745f 5f31 3169 6f61 7070 6c79 5f69 6e74 3a28
2347700 302c 3533 292c 302c 3332 3b3b 0069 6f61 7070 6c79 5f69 6e74 3a5a 6369 6f61 7070 6c79 5f69 6e74 3b3b 5f5f 6374 5f5f 3131
2347760 696f 6170 706c 795f 696e 7446 5046 5238 696f 7374 7265 616d 695f 5238 696f 7374 7265 616d 205f 5f63 6c5f 5f31 3169 6f61
2350040 7070 6c79 5f69 6e74 4669 203b 3b3b 0073 6d61 6e69 705f 6c6f 6e67 3a54 2830 2c35 3729 3d73 3866 6374 5f5f 3131 736d 616e
2350120 6970 5f6c 6f6e 673a 2830 2c34 3029 2c30 2c33 323b 6172 675f 5f31 3173 6d61 6e69 705f 6c6f 6e67 3a28 302c 3129 2c33 322c
2350200 3332 3b3b 0073 6d61 6e69 705f 6c6f 6e67 3a5a 6373 6d61 6e69 705f 6c6f 6e67 3b3b 5f5f 6374 5f5f 3131 736d 616e 6970 5f6c
2350260 6f6e 6746 5046 5233 696f 736c 5f52 3369 6f73 6c20 3b3b 5f5f 6c73 5f5f 4652 376f 7374 7265 616d 5231 3173 6d61 6e69 705f
2350340 6c6f 6e67 205f 5f72 735f 5f46 5237 6973 7472 6561 6d52 3131 736d 616e 6970 5f6c 6f6e 6720 3b00 7361 7070 6c79 5f6c 6f6e
2350420 673a 5428 302c 3538 293d 7334 6663 745f 5f31 3173 6170 706c 795f 6c6f 6e67 3a28 302c 3430 292c 302c 3332 3b3b 0073 6170
2350500 706c 795f 6c6f 6e67 3a5a 6373 6170 706c 795f 6c6f 6e67 3b3b 5f5f 6374 5f5f 3131 7361 7070 6c79 5f6c 6f6e 6746 5046 5233
2350560 696f 736c 5f52 3369 6f73 205f 5f63 6c5f 5f31 3173 6170 706c 795f 6c6f 6e67 466c 203b 3b3b 0069 6d61 6e69 705f 6c6f 6e67
2350640 3a54 2830 2c35 3929 3d73 3866 6374 5f5f 3131 696d 616e 6970 5f6c 6f6e 673a 2830 2c34 3429 2c30 2c33 323b 6172 675f 5f31
2350720 3169 6d61 6e69 705f 6c6f 6e67 3a28 302c 3129 2c33 322c 3332 3b3b 0069 6d61 6e69 705f 6c6f 6e67 3a5a 6369 6d61 6e69 705f
2351000 6c6f 6e67 3b3b 5f5f 6374 5f5f 3131 696d 616e 6970 5f6c 6f6e 6746 5046 5237 6973 7472 6561 6d6c 5f52 3769 7374 7265 616d
2351060 6c20 3b3b 5f5f 7273 5f5f 4652 3769 7374 7265 616d 5231 3169 6d61 6e69 705f 6c6f 6e67 203b 0069 6170 706c 795f 6c6f 6e67
2351140 3a54 2830 2c36 3029 3d73 3466 6374 5f5f 3131 6961 7070 6c79 5f6c 6f6e 673a 2830 2c34 3429 2c30 2c33 323b 3b00 6961 7070
2351220 6c79 5f6c 6f6e 673a 5a63 6961 7070 6c79 5f6c 6f6e 673b 3b5f 5f63 745f 5f31 3169 6170 706c 795f 6c6f 6e67 4650 4652 3769
2351300 7374 7265 616d 6c5f 5237 6973 7472 6561 6d20 5f5f 636c 5f5f 3131 6961 7070 6c79 5f6c 6f6e 6746 6c20 3b3b 3b00 6f6d 616e
2351360 6970 5f6c 6f6e 673a 5428 302c 3631 293d 7338 6663 745f 5f31 316f 6d61 6e69 705f 6c6f 6e67 3a28 302c 3439 292c 302c 3332
2351440 3b61 7267 5f5f 3131 6f6d 616e 6970 5f6c 6f6e 673a 2830 2c31 292c 3332 2c33 323b 3b00 6f6d 616e 6970 5f6c 6f6e 673a 5a63
2351520 6f6d 616e 6970 5f6c 6f6e 673b 3b5f 5f63 745f 5f31 316f 6d61 6e69 705f 6c6f 6e67 4650 4652 376f 7374 7265 616d 6c5f 5237
2351600 6f73 7472 6561 6c6c 203b 3b5f 5f6c 735f 5f46 5237 6f73 7472 6561 6d52 3131 6f6d 616e 6970 5f6c 6f6e 6720 3b00 6f61 7070
2351660 6c79 5f6c 6f6e 673a 5428 302c 3632 293d 7334 6663 745f 5f31 316f 6170 706c 795f 6c6f 6e67 3a28 302c 3439 292c 302c 3332
2351740 3b3b 006f 6170 706c 795f 6c6f 6e67 3a5a 636f 6170 706c 795f 6c6f 6e67 3b3b 5f5f 6374 5f5f 3131 6f61 7070 6c79 5f6c 6f6e

```
2352020 6746 5046 5237 6f73 7472 6561 6d6c 5f52 376f 7374 7265 616d 205f 5f63 6c5f 5f31 316f 6170 706c 795f 6c6f 6e67 466c 203b
2352100 3b3b 0069 6f6d 616e 6970 5f6c 6f6e 673a 5428 302c 3633 2934 7338 6663 745f 5f31 3269 6f6d 616e 6970 5f6c 6f6e 673a 2830
2352160 2c35 3329 2c30 2c33 323b 6172 675f 5f31 3269 6f6d 616e 6970 5f6c 6f6e 673a 2830 2c31 292c 3332 2c33 323b 3b00 696f 6d61
2352240 6e69 705f 6c6f 6e67 3a5a 6369 6f6d 616e 6970 5f6c 6f6e 673b 3b5f 5f63 745f 5f31 3269 6f6d 616e 6970 5f6c 6f6e 6746 5046
2352320 5238 696f 7374 7265 616d 6c5f 5238 696f 7374 7265 616d 6c20 3b3b 5f5f 6c73 5f5f 4652 3869 6f73 7472 6561 6d52 3132 696f
2352400 6d61 6e69 705f 6c6f 6e67 205f 5f72 735f 5f46 5238 696f 7374 7265 616d 5231 3269 6f6d 616e 6970 5f6c 6f6e 6720 3b00 696f
2352460 6170 706c 795f 6c6f 6e67 3a54 2830 2c36 3429 3d73 3466 6374 5f5f 3132 696f 6170 706c 795f 6c6f 6e67 3a28 302c 3533 292c
2352540 302c 3332 3b3b 0069 6f61 7070 6c79 5f6c 6f6e 673a 5a63 696f 6170 706c 795f 6c6f 6e67 3b3b 5f5f 6374 5f5f 3132 696f 6170
2352620 706c 795f 6c6f 6e67 4650 4652 3869 6f73 7472 6561 6d6c 5f52 3869 6f73 7472 6561 6d20 5f5f 636c 5f5f 3132 696f 6170 706c
2352700 795f 6c6f 6e67 466c 203b 3b3b 0065 7272 6e6f 3a47 2830 2c31 2900 7379 735f 6e65 7272 3a47 2830 2c31 2900 7374 6469 6f62
2352760 7566 3a54 2830 2c36 3629 3d73 3532 616c 6c6f 635f 5f39 7374 7265 616d 6275 663a 2830 2c34 292c 302c 3136 3b78 5f75 6e62
2353040 7566 5f5f 3973 7472 6561 6d62 7566 3a28 302c 3429 2c31 362c 3136 3b78 5f62 6173 655f 5f39 7374 7265 616d 6275 663a 2830
2353120 2c33 3129 2c33 322c 3332 3b78 5f70 6261 7365 5f5f 3973 7472 6561 6d62 7566 3a28 302c 3331 292c 3634 2c33 323b 785f 7070
2353200 7472 5f5f 3973 7472 6561 6d62 7566 3a28 302c 3331 292c 3936 2c33 323b 785f 6570 7074 725f 5f39 7374 7265 616d 6275 663a
2353260 2830 2c33 3129 2c31 3238 2c33 323b 785f 6770 7472 5f5f 3973 7472 6561 6d62 7566 3a28 302c 3331 292c 3136 302c 3332 3b78
2353340 5f65 6770 7472 5f5f 3973 7472 6561 6d62 7566 3a28 302c 3331 292c 3139 322c 3332 3b5c 0078 5f65 6261 636b 5f5f 3973 7472
2353420 6561 6162 7566 3a28 302c 3331 292c 3232 342c 3332 3b78 5f62 6c65 6e5f 5f39 7374 7265 616d 6275 663a 2830 2c31 292c 3235
2353500 362c 3332 3b5f 5f76 7074 725f 5f39 7374 7265 616d 6275 663a 2830 2c33 3029 2c32 3838 2c33 323b 6670 5f5f 3873 7464 696f
2353560 6275 663a 2830 2c36 3729 3d2a 2830 2c36 3529 3178 735f 696f 6275 663a 2c33 3230 2c33 323b 6c61 7374 5f6f 705f 5f38 7374
2353640 6469 6f62 7566 3a28 302c 3129 2c33 3532 2c33 323b 6275 665f 5f38 7374 6469 6f62 7566 3a28 302c 3638 293d 6172 2830 2c31
2353720 293b 303b 313b 2830 2c32 292c 3338 342c 3136 3b3b 0073 7464 696f 6275 663a 5a63 7374 6469 6f62 7566 3b73 7472 6561 6d62
2354000 7566 3b6f 7665 7266 6c6f 775f 5f38 7374 6469 6f62 7566 4669 2075 6e64 6572 666c 6f77 5f5f 3873 7464 696f 6275 6646 7620
2354060 7379 6e63 5f5f 3873 7464 696f 6275 6646 7620 7365 656b 6f66 665f 5f38 7374 6469 6f62 7566 466c 3873 6565 6b5f 6469 7269
2354140 2070 6261 636b 6661 696c 5f5f 3873 7464 696f 6275 6646 6920 5f5f 6374 5f5f 3873 7464 696f 6275 6646 5036 5f69 6f62 7566
2354220 205f 5f63 745f 5f38 7374 6469 6f62 7566 4652 4338 7374 6469 6f62 7566 205c 0073 7464 696f 6669 6c65 5f5f 3873 7464 696f
2354300 6275 6646 7620 5f5f 6474 5f5f 3873 7464 696f 6275 6646 7620 3b3b 3b00 6669 6c65 6275 663a 5428 302c 3639 293d 7336 3461
2354360 6c6c 6f63 5f5f 3973 7472 6561 6d62 7566 3a28 302c 3429 2c30 2c31 363b 785f 756e 6275 665f 5f39 7374 7265 616d 6275 663a
2354440 2830 2c34 292c 3136 2c31 363b 785f 6261 7365 5f5f 3973 7472 6561 6d62 7566 3a28 302c 3331 292c 3332 2c33 323b 785f 7062
2354520 6173 655f 5f39 7374 7265 616d 6275 663a 2830 2c33 3129 2c36 342c 3332 3b78 5f70 7074 725f 5f39 7374 7265 616d 6275 663a
2354600 2830 2c33 3129 2c39 362c 3332 3b78 5f65 7070 7472 5f5f 3973 7472 6561 6d62 7566 3a28 302c 3331 292c 3132 382c 3332 3b78
2354660 5f67 7074 725f 5f39 7374 7265 616d 6275 663a 2830 2c33 3129 2c31 3630 2c33 323b 785f 6567 7074 725f 5f39 7374 7265 616d
2354740 6275 663a 2830 2c33 3129 2c31 3932 2c33 323b 5c00 785f 6562 6163 6b5f 5f39 7374 7265 616d 6275 663a 2830 2c33 3129 2c32
2355020 3234 2c33 323b 795f 626c 656e 5f5f 3973 7472 6561 6d62 7566 3a28 302c 3129 2c32 3536 2c33 323b 5f5f 7670 7472 5f5f 3973
2355100 7472 6561 6d62 7566 3a28 302c 3330 292c 3238 382c 3332 3b78 6664 5f5f 3766 696c 6562 7566 3a28 302c 3129 2c33 3230 2c33
2355160 323b 6d6f 6465 5f5f 3766 696c 6562 7566 3a28 302c 3129 2c33 3532 2c33 323b 6f70 656e 6564 5f5f 3766 696c 6562 7566 3a28
2355240 302c 3229 2c33 3934 2c38 3b6c 6173 745f 7365 656b 5f5f 3766 696c 6562 7566 3a28 302c 3129 2c34 3136 2c33 323b 696e 5f73
2355320 7461 7274 5f5f 3766 696c 6562 7566 3a28 302c 3331 292c 3434 382c 3332 3b6c 6168 6561 645f 5f37 6669 6c65 6275 663a 2830
2355400 2c36 3829 2c34 3830 2c31 363b 3b00 6f70 656e 7072 6f74 5f5f 3766 696c 6562 7566 3a47 2830 2c31 2900 6669 6c65 6275 663a
2355460 5a63 6669 6c65 6275 663b 7374 7265 616d 6275 663b 5f5f 6374 5f5f 3766 696c 6562 7566 4676 205f 5f63 745f 5f37 6669 6c65
2355540 6275 6646 6920 5f5f 6374 5f5f 3766 696c 6562 7566 4669 5063 5431 205f 5f63 745f 5f37 6669 6c65 6275 6646 5243 3766 696c
2355620 6562 7566 2069 735f 6f70 656e 5f5f 3766 696c 6562 7566 4676 2066 645f 5f37 6669 6c65 6275 6646 7620 6f70 656e 5f5f 3766
2355700 696c 6562 7566 4650 4363 6954 3220 6174 7461 6368 5f5f 3766 696c 6562 7566 4669 2063 6c6f 7365 5f5f 3766 696c 6562 7566
2355760 4676 205c 005f 5f64 745f 5f37 6669 6c65 6275 6646 7620 6f76 6572 666c 6f77 5f5f 3766 696c 6562 7566 4669 2075 6e64 6572
2356040 666c 6f77 5f5f 3766 696c 6562 7566 4676 2073 796e 635f 5f37 6669 6c65 6275 6646 7620 7365 656b 6f66 665f 5f37 6669 6c65
2356120 6275 6646 6c38 7365 656b 5f64 6972 6920 7365 7462 7566 5f5f 3766 696c 6562 7566 4650 6369 206c 6173 745f 6f70 5f5f 3766
2356200 696c 6562 7566 4676 203b 6f70 656e 7072 6f74 5f5f 3766 696c 6562 7566 203b 3b00 6673 7472 6561 6d62 6173 653a 5428 302c
2356260 3730 293d 7331 3332 6275 665f 5f31 3166 7374 7265 616d 6261 7365 3a28 302c 3639 292c 302c 3531 323b 5f5f 7670 7472 5f5f
2356340 3131 6673 7472 6561 6d62 6173 653a 2830 2c33 3029 2c35 3132 2c33 323b 5069 6f73 3a28 302c 3333 292c 3534 342c 3332 3b4f
2356420 696f 733a 2830 2c32 3329 2c35 3736 2c34 3830 3b3b 0066 7374 7265 6161 6261 7365 3a5a 6366 7374 7265 616d 6261 7365 3b69
2356500 6f73 3b5f 5f63 745f 5f31 3166 7374 7265 616d 6261 7365 4676 205f 5f63 745f 5f31 3166 7374 7265 616d 6261 7365 4650 4363
2356560 6954 3220 5f5f 6374 5f5f 3131 6673 7472 6561 6d62 6173 6546 6920 5f5f 6374 5f5f 3131 6673 7472 6561 6d62 6173 6546 6950
2356640 6354 3120 5f5f 6374 5f5f 3131 6673 7472 6561 6d62 6173 6546 5231 3166 7374 7265 616d 6261 7365 205f 5f64 745f 5f31 3166
2356720 7374 7265 616d 6261 7365 4676 206f 7065 6e5f 5f31 3166 7374 7265 616d 6261 7365 4650 4363 6954 3220 5c00 6174 7461 6368
2357000 5f5f 3131 6673 7472 6561 6d62 6173 6546 6920 636c 6f73 655f 5f31 3166 7374 7265 616d 6261 7365 4676 2073 6574 6275 665f
2357060 5f31 3166 7374 7265 616d 6261 7365 4650 6369 2072 6462 7566 5f5f 3131 6673 7472 6561 6d62 6173 6546 7620 7665 7269 6679
```

```
2357140  5f5f 3131 6673 7472 6561 6d62 6173 6546 6920 3b3b 3b00 7374 6174 655f 7661 6c75 653a 7428 302c 3138 2900 5661 6c75 655f
2357220  5479 7065 3a54 2830 2c37 3129 3d65 554e 4b4e 4f57 4e56 3a30 2c53 5452 494e 473a 312c 494e 5445 4745 523a 322c 464c 4f41
2357300  543a 332c 3b00 426c 6f63 6b5f 5479 7065 3a54 2830 2c37 3229 3d65 554e 4b4e 4f57 4e42 3a30 2c45 4e54 4954 593a 312c 4655
2357360  4e43 5449 4f4e 3a32 2c50 524f 4345 4455 5245 3a33 2c3b 0045 6e74 6974 795f 5479 7065 3a54 2830 2c37 3329 3d65 554e 4b4e
2357440  4f57 4e45 3a30 2c41 5243 4849 5445 4354 5552 453a 312c 5355 4250 524f 4752 414d 3a32 2c3b 0050 696e 5f54 7970 653a 5428
2357520  302c 3734 293d 6555 4e4b 4e4f 574e 503a 302c 494e 5049 4e3a 312c 4f55 5450 494e 3a32 2c49 4e4f 5554 5049 4e3a 332c 3b00
2357600  5061 7261 5f43 6c61 7373 3a54 2830 2c37 3529 3d65 554e 4b4e 4f57 4e43 3a30 2c46 4f52 4d41 4c3a 312c 4143 5455 414c 3a32
2357660  2c52 4553 4f4c 5645 443a 332c 3b00 424f 4f4c 4541 4e3a 5428 302c 3736 293d 6546 616c 7365 3a30 2c54 7275 653a 312c 3b00
2357740  426f 6f6c 6561 6e3a 5428 302c 3737 293d 6566 616c 7365 3a30 2c74 7275 653a 312c 3b00 4275 6666 6572 3a47 2830 2c33 3129
2360020  004f 626a 6563 743a 5428 302c 3738 293d 7334 5f5f 7670 7472 5f5f 364f 626a 6563 743a 2830 2c33 3029 2c30 2c33 323b 3b00
2360100  4f62 6a65 6374 3a5a 634f 626a 6563 743b 3b5f 5f63 745f 5f36 4f62 6a65 6374 4676 205f 5f63 745f 5f36 4f62 6a65 6374 4652
2360160  4336 4f62 6a65 6374 2065 7272 6f72 4d65 6d6f 7279 5f5f 364f 626a 6563 7446 5063 5431 2065 7870 6c61 696e 5f5f 364f 626a
2360240  6563 7446 5063 2069 6e4f 7264 6572 5f5f 364f 626a 6563 7446 5036 4f62 6a65 6374 203b 3b3b 005f 5f70 7462 6c5f 5f36 4f62
2360320  6a65 6374 5f5f 6174 7472 6962 7574 655f 6378 783a 4728 302c 3330 2900 5046 3a74 2830 2c31 3529 0050 4643 3a74 2830 2c31
2360400  3529 0050 4649 3a74 2830 2c31 3529 004e 4f62 6a65 6374 3a54 2830 2c37 3929 3d73 385f 5f76 7074 725f 5f36 4f62 6a65 6374
2360460  3a28 302c 3330 292c 302c 3332 3b6e 616d 655f 5f37 4e4f 626a 6563 743a 2830 2c33 3129 2c33 322c 3332 3b3b 004e 4f62 6a65
2360540  6374 3a5a 634e 4f62 6a65 6374 3b4f 626a 6563 743b 5f5f 6374 5f5f 374e 4f62 6a65 6374 4650 6320 5f5f 6374 5f5f 374e 4f62
2360620  6a65 6374 4652 4337 4e4f 626a 6563 7420 7365 744e 616d 655f 5f37 4e4f 626a 6563 7446 5063 2067 6574 4e61 6d65 5f5f 374e
2360700  4f62 6a65 6374 4676 2065 7870 6c61 696e 5f5f 374e 4f62 6a65 6374 4650 6320 6765 7441 7474 725f 5f37 4e4f 626a 6563 7446
2360760  6920 6765 7450 726f 705f 5f37 4e4f 626a 6563 7446 5063 6920 7365 7450 726f 705f 5f37 4e4f 626a 6563 7446 5063 5431 205c
2361040  0073 6574 5072 6f70 5f5f 374e 4f62 6a65 6374 4650 6369 2073 6574 5072 6f70 5f5f 374e 4f62 6a65 6374 4650 6366 2069 7347
2361120  5445 5f5f 374e 4f62 6a65 6374 4650 364f 626a 6563 7420 6973 4c54 455f 5f37 4e4f 626a 6563 7446 5036 4f62 6a65 6374 203b
2361200  3b3b 006f 7374 7265 616d 5f77 6974 6861 7373 6967 6e3a 5428 302c 3337 293d 7336 385f 5f76 7074 725f 5f37 6f73 7472 6561
2361260  6d3a 2830 2c33 3029 2c30 2c33 323b 5069 6f73 3a28 302c 3333 292c 3332 2c33 323b 4f69 6f73 3a28 302c 3233 292c 3634 2c34
2361340  3830 3b3b 006f 7374 7265 616d 5f77 6974 6861 7373 6967 6e3a 5a63 6f73 7472 6561 6d5f 7769 7468 6173 7369 676e 3b6f 7374
2361420  7265 616d 2069 6f73 3b5f 5f63 745f 5f31 386f 7374 7265 616d 5f77 6974 6861 7373 6967 6e46 7620 5f5f 6374 5f5f 3138 6f73
2361500  7472 6561 6d5f 7769 7468 6173 7369 676e 4652 3138 6f73 7472 6561 6d5f 7769 7468 6173 7369 676e 205f 5f64 745f 5f31 386f
2361560  7374 7265 616d 5f77 6974 6861 7373 6967 6e46 7620 5f5f 6173 5f5f 3138 6f73 7472 6561 6d5f 7769 7468 6173 7369 676e 4652
2361640  376f 7374 7265 616d 205c 005f 5f61 735f 5f31 386f 7374 7265 616d 5f77 6974 6861 7373 6967 6e46 5039 7374 7265 616d 6275
2361720  6620 3b3b 3b00 5046 423a 7428 302c 3135 2900 4c4e 4f62 6a65 6374 3a54 2830 2c38 3029 3d73 3132 5f5f 7670 7472 5f5f 364f
2362000  626a 6563 743a 2830 2c33 3029 2c30 2c33 323b 6e61 6d65 5f5f 374e 4f62 6a65 6374 3a28 302c 3331 292c 3332 2c33 323b 6e65
2362060  7874 5f5f 384c 4e4f 626a 6563 743a 2830 2c38 3129 3d2a 2830 2c38 3029 2c36 342c 3332 3b3b 004c 4e4f 626a 6563 743a 5a63
2362140  4c4e 4f62 6a65 6374 3b4e 4f62 6a65 6374 3b5f 5f63 745f 5f38 4c4e 4f62 6a65 6374 4650 6350 384c 4e4f 626a 6563 7420 5f5f
2362220  6374 5f5f 384c 4e4f 626a 6563 7446 5243 384c 4e4f 626a 6563 7420 7365 744e 6578 745f 5f38 4c4e 4f62 6a65 6374 4650 384c
2362300  4e4f 626a 6563 7420 6765 744e 6578 745f 5f38 4c4e 4f62 6a65 6374 4676 203b 3b3b 004c 4f62 6a65 6374 3a54 2830 2c38 3229
2362360  3d73 385f 5f76 7074 725f 5f36 4f62 6a65 6374 3a28 302c 3330 292c 302c 3332 3b6e 6578 745f 5f37 4c4f 626a 6563 743a 2830
2362440  2c38 3329 3d2a 2830 2c38 3229 2c33 322c 3332 3b3b 004c 4f62 6a65 6374 3a5a 634c 4f62 6a65 6374 3b4f 626a 6563 743b 5f5f
2362520  6374 5f5f 374c 4f62 6a65 6374 4650 374c 4f62 6a65 6374 205f 5f63 745f 5f37 4c4f 626a 6563 7446 5243 374c 4f62 6a65 6374
2362600  2073 6574 4e65 7874 5f5f 374c 4f62 6a65 6374 4650 374c 4f62 6a65 6374 2067 6574 4e65 7874 5f5f 374c 4f62 6a65 6374 4676
2362660  203b 3b3b 004c 504f 626a 6563 743a 5428 302c 3834 293d 7331 325f 5f76 7074 725f 5f36 4f62 6a65 6374 3a28 302c 3330 292c
2362740  302c 3332 3b6e 6578 745f 5f37 4c4f 626a 6563 743a 2830 2c38 3329 2c33 322c 3332 3b6e 6f62 6a70 7472 5f5f 384c 504f 626a
2363020  6563 743a 2830 2c38 3529 3d2a 2830 2c37 3929 2c36 342c 3332 3b3b 004c 504f 626a 6563 743a 5a63 4c50 4f62 6a65 6374 3b4c
2363100  4f62 6a65 6374 3b5f 5f63 745f 5f38 4c50 4f62 6a65 6374 4650 374e 4f62 6a65 6374 5037 4c4f 626a 6563 7420 5f5f 6374 5f5f
2363160  384c 504f 626a 6563 7446 5243 384c 504f 626a 6563 7420 7365 744f 626a 6563 745f 5f38 4c50 4f62 6a65 6374 4650 374e 4f62
2363240  6a65 6374 2067 6574 4f62 6a65 6374 5f5f 384c 504f 626a 6563 7446 7620 6578 706c 6169 6e5f 5f38 4c50 4f62 6a65 6374 4650
2363320  6320 3b3b 3b00 5f5f 7074 626c 5f5f 384c 504f 626a 6563 745f 5f61 7474 7269 6275 7465 5f63 7878 3a47 2830 2c33 3029 005f
2363400  5f43 3434 3a54 2830 2c38 3629 3d75 3473 7661 6c75 653a 2830 2c33 3129 2c30 2c33 323b 6976 616c 7565 3a28 302c 3129 2c30
2363460  2c33 323b 6676 616c 7565 3a28 302c 3929 2c30 2c33 323b 3b00 5f5f 4334 343a 5a63 5f5f 4334 343b 3b3b 3b3b 0047 656e 5661
2363540  6c75 653a 5428 302c 3837 293d 7331 365f 5f76 7074 725f 5f36 4f62 6a65 6374 3a28 302c 3330 292c 302c 3332 3b6e 616d 655f
2363620  5f37 4e4f 626a 6563 743a 2830 2c33 3129 2c33 322c 3332 3b74 7970 655f 5f38 4765 6e56 616c 7565 3a28 302c 3731 292c 3634
2363700  2c33 323b 5f5f 4f34 345f 5f39 4765 6e56 616c 7565 3a28 302c 3836 292c 3936 2c33 323b 3b00 4765 6e56 616c 7565 3a5a 6347
2363760  656e 5661 6c75 653b 4e4f 626a 6563 743b 5f5f 6374 5f5f 3847 656e 5661 6c75 6546 7620 5f5f 6374 5f5f 3847 656e 5661 6c75
2364040  6546 5243 3847 656e 5661 6c75 6520 5f5f 6474 5f5f 3847 656e 5661 6c75 6546 7620 7365 745f 4765 6e56 616c 7565 5f74 7970
2364120  655f 5f38 4765 6e56 616c 7565 4650 6369 2073 6574 5f47 656e 5661 6c75 655f 7479 7065 5f5f 3847 656e 5661 6c75 6546 3130
2364200  5661 6c75 655f 5479 7065 2073 6574 5f47 656e 5661 6c75 655f 5f38 4765 6e56 616c 7565 4650 6320 5c00 7365 745f 4765 6e56
```

```
2364260 616c 7565 5f5f 3847 656e 5661 6c75 6546 6920 7365 745f 4765 6e56 616c 7565 5f5f 3847 656e 5661 6c75 6546 6620 6765 745f
2364340 4765 6e56 616c 7565 5f74 7970 655f 5f38 4765 6e56 616c 7565 4676 2067 6574 5f47 656e 5661 6c75 655f 735f 5f38 4765 6e56
2364420 616c 7565 4676 2067 6574 5f47 656e 5661 6c75 655f 695f 5f38 4765 6e56 616c 7565 4676 2067 6574 5f47 656e 5661 6c75 655f
2364500 665f 5f38 4765 6e56 616c 7565 4676 2065 7870 6c61 696e 5f5f 3847 656e 5661 6c75 6546 5063 205c 0063 6865 636b 5f5f 3847
2364560 656e 5661 6c75 6546 6920 3b3b 3b00 5f5f 7074 626c 5f5f 3847 656e 5661 6c75 655f 5f61 7474 7269 6275 7465 5f63 7878 3a47
2364640 2830 2c33 3029 0062 6c6f 636b 5f61 7474 7269 6275 7465 733a 5428 302c 3838 293d 7332 385f 5f76 7074 725f 5f36 4f62 6a65
2364720 6374 3a28 302c 3330 292c 302c 3332 3b6e 616d 655f 5f37 4e4f 626a 6563 743a 2830 2c33 3129 2c33 322c 3332 3b6e 616d 655f
2365000 5f31 3662 6c6f 636b 5f61 7474 7269 6275 7465 733a 2830 2c33 3129 2c36 342c 3332 3b76 616c 7565 5f5f 3136 626c 6f63 6b5f
2365060 6174 7472 6962 7574 6573 3a28 302c 3837 292c 3936 2c31 3238 3b3b 0062 6c6f 636b 5f61 7474 7269 6275 7465 733a 5a63 626c
2365140 6f63 6b5f 6174 7472 6962 7574 6573 3b4e 4f62 6a65 6374 3b5f 5f63 745f 5f31 3662 6c6f 636b 5f61 7474 7269 6275 7465 7346
2365220 5063 205f 5f63 745f 5f31 3662 6c6f 636b 5f61 7474 7269 6275 7465 7346 7620 5f5f 6374 5f5f 3136 626c 6f63 6b5f 6174 7472
2365300 6962 7574 6573 4652 4331 3662 6c6f 636b 5f61 7474 7269 6275 7465 7320 5f5f 6474 5f5f 3136 626c 6f63 6b5f 6174 7472 6962
2365360 7574 6573 4676 2073 6574 5f61 7474 7269 6275 7465 5f6e 616d 655f 5f31 3662 6c6f 636b 5f61 7474 7269 6275 7465 7346 5063
2365440 205c 0073 6574 5f61 7474 7269 6275 7465 5f76 616c 7565 5f5f 3136 626c 6f63 6b5f 6174 7472 6962 7574 6573 4650 6320 7365
2365520 745f 6174 7472 6962 7574 655f 7661 6c75 655f 5f31 3662 6c6f 636b 5f61 7474 7269 6275 7465 7346 6920 7365 745f 6174 7472
2365600 6962 7574 655f 7661 6c75 655f 5f31 3662 6c6f 636b 5f61 7474 7269 6275 7465 7346 6620 7365 745f 6174 7472 6962 7574 655f
2365660 7479 7065 5f5f 3136 626c 6f63 6b5f 6174 7472 6962 7574 6573 4650 6320 6765 745f 6174 7472 6962 7574 655f 6e61 6d65 5f5f
2365740 3136 626c 6f63 6b5f 6174 7472 6962 7574 6573 4676 205c 0067 6574 5f61 7474 7269 6275 7465 5f74 7970 655f 5f31 3662 6c6f
2366020 636b 5f61 7474 7269 6275 7465 7346 7620 6765 745f 6174 7472 6962 7574 655f 7376 616c 7565 5f5f 3136 626c 6f63 6b5f 6174
2366100 7472 6962 7574 6573 4676 2067 6574 5f61 7474 7269 6275 7465 5f69 7661 6c75 655f 5f31 3662 6c6f 636b 5f61 7474 7269 6275
2366160 7465 7346 7620 6765 745f 6174 7472 6962 7574 655f 6676 616c 7565 5f5f 3136 626c 6f63 6b5f 6174 7472 6962 7574 6573 4676
2366240 2067 6574 5f61 7474 7269 6275 7465 5f76 616c 7565 5f5f 3136 626c 6f63 6b5f 6174 7472 6962 7574 6573 4676 205c 0065 7870
2366320 6c61 696e 5f5f 3136 626c 6f63 6b5f 6174 7472 6962 7574 6573 4650 6320 3b3b 3b00 5f5f 7074 626c 5f5f 3136 626c 6f63 6b5f
2366400 6174 7472 6962 7574 6573 5f5f 6174 7472 6962 7574 655f 6378 783a 4728 302c 3330 2900 5f5f 7374 695f 5f61 7474 7269 6275
2366460 7465 5f63 7878 5f3a 4628 302c 3229 005f 5f73 7464 5f5f 6174 7472 6962 7574 655f 6378 785f 3a46 2830 2c32 2900 5f5f 7674
2366540 626c 5f5f 3136 626c 6f63 6b5f 6174 7472 6962 7574 6573 5f5f 6174 7472 6962 7574 655f 6378 783a 4728 302c 3839 293d 6172
2366620 2830 2c31 293b 303b 3130 3b28 302c 3135 2900 5f5f 7674 626c 5f5f 384c 504f 626a 6563 745f 5f61 7474 7269 6275 7465 5f63
2366700 7878 3a47 2830 2c39 3029 3d61 7228 302c 3129 3b30 3b33 3b28 302c 3135 2900 6578 706c 6169 6e5f 5f31 3662 6c6f 636b 5f61
2366760 7474 7269 6275 7465 7346 5063 3a66 2830 2c32 2900 5f5f 3074 6869 733a 7028 302c 3931 293d 2a28 302c 3838 2900 5f5f 3073
2367040 3a70 2830 2c33 3129 002e 2f68 7878 2f61 7474 7269 6275 7465 2e68 7878 005f 5f30 7468 6973 3a72 2830 2c39 3129 005f 5f30
2367120 7468 6973 203a 5a74 6c00 5f5f 3073 203a 5a74 6c00 6578 706c 6169 6e5f 5f31 3662 6c6f 636b 5f61 7474 7269 6275 7465 7346
2367200 5063 203a 5a74 4600 6578 706c 6169 6e5f 5f38 4c50 4f62 6a65 6374 4650 633a 6628 302c 3229 005f 5f30 7468 6973 3a70 2830
2367260 2c39 3229 3d2a 2830 2c38 3429 005f 5f30 733a 7028 302c 3331 2900 2f68 6f6d 652f 6f73 6173 312f 612f 6162 2f73 7263 2f6e
2367340 6577 6f62 6a65 6374 732f 6878 782f 4c50 4f62 6a65 6374 5f64 622e 6878 7800 5f5f 3074 6869 733a 7228 302c 3932 2900 5f5f
2367420 3074 6869 7320 3a5a 746c 005f 5f30 7320 3a5a 746c 0065 7870 6c61 696e 5f5f 384c 504f 626a 6563 7446 5063 203a 5a74 4600
2367500 6973 4c54 455f 5f37 4e4f 626a 6563 7446 5036 4f62 6a65 6374 3a66 2830 2c31 2900 5f5f 3074 6869 733a 7028 302c 3835 2900
2367560 5f5f 305f 5f41 3339 3a70 2830 2c39 3329 3d2a 2830 2c37 3829 002f 686f 6d65 2f6f 7361 7331 2f61 2f61 622f 7372 632f 6e65
2367640 776f 626a 6563 7473 2f68 7870 2f4e 4f62 6a65 6374 5f64 622e 6878 7800 5f5f 3074 6869 7320 3a5a 746c 005f 5f30 5f5f 4133
2367720 3920 3a5a 746c 0069 734c 5445 5f5f 374e 4f62 6a65 6374 4650 364f 626a 6563 7420 3a5a 7446 0069 7347 5445 5f5f 374e 4f62
2370000 6a65 6374 4650 364f 626a 6563 743a 6628 302c 3129 005f 5f30 7468 6973 3a70 2830 2c38 3529 005f 5f30 5f5f 4133 383a 7028
2370060 302c 3933 2900 5f5f 3074 6869 7320 3a5a 746c 005f 5f30 5f5f 4133 3820 3a5a 746c 0069 7347 5445 5f5f 374e 4f62 6a65 6374
2370140 4650 364f 626a 6563 7420 3a5a 7446 0073 6574 5072 6f70 5f5f 374e 4f62 6a65 6374 4650 6366 3a66 2830 2c32 2900 5f5f 3074
2370220 6869 733a 7028 302c 3835 2900 5f5f 315f 5f41 3336 3a70 2830 2c33 3129 005f 5f31 5f5f 4133 373a 7028 302c 3130 2900 5f5f
2370300 3074 6869 7320 3a5a 746c 005f 5f31 5f5f 4133 3620 3a5a 746c 005f 5f31 5f5f 4133 3720 3a5a 746c 0073 6574 5072 6f70 5f5f
2370360 374e 4f62 6a65 6374 4650 6366 203a 5a74 4600 7365 7450 726f 705f 5f37 4e4f 626a 6563 7446 5063 693a 6628 302c 3229 005f
2370440 5f30 7468 6973 3a70 2830 2c38 3529 005f 5f31 5f5f 4133 343a 7028 302c 3331 2900 5f5f 315f 5f41 3335 3a70 2830 2c31 2900
2370520 5f5f 3074 6869 7320 3a5a 746c 005f 5f31 5f5f 4133 3420 3a5a 746c 005f 5f31 5f5f 4133 3520 3a5a 746c 0073 6574 5072 6f70
2370600 5f5f 374e 4f62 6a65 6374 4650 6369 203a 5a74 4600 7365 7450 726f 705f 5f37 4e4f 626a 6563 7446 5063 5431 3a66 2830 2c32
2370660 2900 5f5f 3074 6869 733a 7028 302c 3835 2900 5f5f 315f 5f41 3332 3a70 2830 2c33 3129 005f 5f31 5f5f 4133 333a 7028 302c
2370740 3331 2900 5f5f 3074 6869 7320 3a5a 746c 005f 5f31 5f5f 4133 3220 3a5a 746c 005f 5f31 5f5f 4133 3320 3a5a 746c 0073 6574
2371020 5072 6f70 5f5f 374e 4f62 6a65 6374 4650 6354 3120 3a5a 7446 0067 6574 5072 6f70 5f5f 374e 4f62 6a65 6374 4650 6369 3a66
2371100 2830 2c33 3129 005f 5f30 7468 6973 3a70 2830 2c38 3529 005f 5f30 5f5f 4133 303a 7028 302c 3331 2900 5f5f 305f 5f41 3331
2371160 3a70 2830 2c31 2900 5f5f 3074 6869 7320 3a5a 746c 005f 5f30 5f5f 4133 3020 3a5a 746c 005f 5f30 5f5f 4133 3120 3a5a 746c
2371240 0067 6574 5072 6f70 5f5f 374e 4f62 6a65 6374 4650 6369 203a 5a74 4600 6765 7441 7474 725f 5f37 4e4f 626a 6563 7446 693a
2371320 6628 302c 3331 2900 5f5f 3074 6869 733a 7028 302c 3835 2900 5f5f 305f 5f41 3239 3a70 2830 2c31 2900 5f5f 3074 6869 7320
```

2371400 3a5a 746c 005f 5f30 5f5f 4132 3920 3a5a 746c 0067 6574 4174 7472 5f5f 374e 4f62 6a65 6374 4669 203a 5a74 4600 696e 4f72
2371460 6465 725f 5f36 4f62 6a65 6374 4650 364f 626a 6563 743a 6628 302c 3129 005f 5f30 7468 6973 3a70 2830 2c39 3329 005f 5f30
2371540 5f5f 4132 373a 7028 302c 3933 2900 2f68 6f6d 652f 6f73 6173 312f 612f 6162 2f73 7263 2f6e 6577 6f62 6a65 6374 732f 6878
2371620 782f 4f62 6a65 6374 5f64 622e 6978 7800 5f5f 3074 6869 7320 3a5a 746c 005f 5f30 5f5f 4132 3720 3a5a 746c 0069 6e4f 7264
2371700 6572 5f5f 364f 626a 6563 7446 5036 4f62 6a65 6374 203a 5a74 4600 626c 6f63 6b2e 6f00 5f73 6574 5f70 6172 616d 6574 6572
2371760 5f76 616c 7565 5f74 7970 655f 5f39 7061 7261 6d65 7465 7246 5063 005f 7365 7450 726f 705f 5f37 4e4f 626a 6563 7446 5063
2372040 6600 5f73 6574 5072 6f70 5f5f 374e 4f62 6a65 6374 4650 6369 005f 6578 706c 6169 6e5f 5f31 3662 6c6f 636b 5f61 7474 7269
2372120 6275 7465 7346 5063 005f 6765 7441 7474 725f 5f37 4e4f 626a 6563 7446 6900 5f70 7574 5f5f 376f 7374 7265 616d 4663 005f
2372200 7365 7450 726f 705f 5f37 4e4f 626a 6563 7446 5063 5431 005f 696f 7374 7265 616d 5f69 6e69 7400 5f69 734c 5445 5f5f 374e
2372260 4f62 6a65 6374 4650 364f 626a 6563 7400 5f69 7347 5445 5f5f 374e 4f62 6a65 6374 4650 364f 626a 6563 7400 5f65 7870 6c61
2372340 696e 5f5f 384c 504f 626a 6563 7446 5063 005f 6765 7450 726f 705f 5f37 4e4f 626a 6563 7446 5063 6900 5f5f 5f63 745f 5f36
2372420 656e 7469 7479 4676 005f 696e 4f72 6465 725f 5f36 4f62 6a65 6374 4650 364f 626a 6563 7400 2f68 6f6d 652f 6f73 6173 312f
2372500 612f 6162 2f73 7263 2f6e 6577 6f62 6a65 6374 732f 7072 6f67 2f43 2b2b 2e32 3332 3334 2f00 626c 6f63 6b2e 6300 626c 6f63
2372560 6b2e 6378 7800 696e 743a 7428 302c 3129 3d72 2830 2c31 293b 2132 3134 3734 3833 3634 383b 3231 3437 3438 3336 3437 3b00
2372640 6368 6172 3a74 2830 2c32 293d 7228 302c 3229 3b30 3b31 3237 3b00 6c6f 6e67 3a74 2830 2c33 293d 7228 302c 3129 3b2d 3231
2372720 3437 3439 3336 3438 3b32 3134 3734 3833 3634 373b 0073 686f 7274 3a74 2830 2c34 293d 7228 302c 3129 3b2d 3332 3736 383b
2373000 3332 3736 373b 0075 6e73 6967 6e65 6420 6368 6172 3a74 2830 2c35 293d 7228 302c 3129 3b30 3b32 3535 3b00 756e 7369 676e
2373060 6564 2073 686f 7274 3a74 2830 2c36 293d 7228 302c 3129 3b30 3b36 3535 3335 3b00 756e 7369 676e 6564 206c 6f6e 673a 7428
2373140 302c 3729 3d72 2830 2c31 293b 303b 2d31 3b00 756e 7369 676e 6564 2069 6e74 3a74 2830 2c38 293d 7228 302c 3129 3b30 3b2d
2373220 313b 0066 6c6f 6174 3a74 2830 2c39 293d 7228 302c 3129 3b34 3b30 3b00 646f 7562 6c65 3a74 2830 2c31 3029 3d72 2830 2c31
2373300 293b 383b 303b 0076 6f69 643a 7428 302c 3131 293d 2830 2c31 3129 003f 3f3f 3a74 2830 2c31 3229 3d28 302c 3129 005f 5f76
2373360 7074 703a 7428 302c 3133 293d 2a28 302c 3134 293d 6628 302c 3129 005f 5f6d 7074 723a 5428 302c 3135 293d 7338 643a 2830
2373440 2c34 292c 302c 3136 3b69 3a28 302c 3429 2c31 362c 3136 3b66 3a28 302c 3133 292c 3332 2c33 323b 3b00 5f50 4656 5f3a 7428
2373520 302c 3136 293d 2a28 302c 3137 293d 6628 302c 3229 005f 5046 495f 3a74 2830 2c31 3329 0065 7272 6e6f 3a47 2830 2c31 2900
2373600 7379 735f 6e65 7272 3a47 2830 2c31 2900 656e 7669 726f 6e3a 4728 302c 3139 293d 2a28 302c 3230 293d 2a28 302c 3229 0065
2373660 6e64 3a47 2830 2c31 2900 6574 6578 743a 4728 302c 3129 0065 6461 7461 3a47 2830 2c31 2900 6f70 7461 7267 3a47 2830 2c32
2373740 3029 006f 7074 696e 643a 4728 302c 3129 006f 7074 6572 723a 4728 302c 3129 0070 7472 6469 6666 5f74 3a74 2830 2c31 2900
2374020 7369 7a65 5f74 3a74 2830 2c38 2900 7374 7265 616d 706f 733a 7428 302c 3129 0073 7472 6561 6d6f 6666 3a74 2830 2c31 2900
2374100 696f 5f73 7461 7465 3a54 2830 2c32 3129 3d65 676f 6f64 6269 745f 5f69 6f5f 7374 6174 653a 302c 656f 6662 6974 5f5f 696f
2374160 5f73 7461 7465 3a31 2c66 6169 6c62 6974 5f5f 696f 5f73 7461 7465 3a32 2c62 6164 6269 745f 5f69 6f5f 7374 6174 653a 332c
2374240 6861 7264 6661 696c 5f5f 696f 5f73 7461 7465 3a34 2c3b 006f 7065 6e5f 6d6f 6465 3a54 2830 2c32 3229 3d65 696e 5f5f 6f70
2374320 656e 5f6d 6f64 653a 302c 6f75 745f 5f6f 7065 6e5f 6d6f 6465 3a31 2c61 7465 5f5f 6f70 656e 5f6d 6f64 653a 322c 6170 705f
2374400 5f6f 7065 6e5f 6d6f 6465 3a33 2c74 7275 6e63 5f5f 6f70 656e 5f6d 6f64 653a 342c 6e6f 6372 6561 7465 5f5f 6f70 656e 5f6d
2374460 6f64 653a 352c 6e6f 7265 706c 6163 655f 5f6f 7065 6e5f 6d6f 6465 3a36 2c3b 0073 6565 6b5f 6469 723a 5428 302c 3233 293d
2374540 6562 6567 5f5f 7365 656b 5f64 6972 3a30 2c63 7572 5f5f 7365 656b 5f64 6972 3a31 2c65 6e64 5f5f 7365 656b 5f64 6972 3a32
2374620 2c3b 005f 5f45 313a 5428 302c 3234 293d 6573 6b69 7077 735f 5f5f 5f45 313a 302c 6c65 6674 5f5f 5f5f 4531 3a31 2c72 6967
2374700 6874 5f5f 5f5f 4531 3a32 2c69 6e74 6572 6e61 6c5f 5f5f 5f45 313a 332c 6465 635f 5f5f 5f45 313a 342c 6f63 745f 5f5f 5f45
2374760 313a 352c 6865 785f 5f5f 5f45 313a 362c 7368 6f77 6261 7365 5f5f 5f5f 4531 3a37 2c5c 0073 686f 7770 6f69 6e74 5f5f 5f5f
2375040 4531 3a38 2c75 7070 6572 6361 7365 5f5f 5f5f 4531 3a39 2c73 686f 7770 6f73 5f5f 5f5f 4531 3a31 302c 7363 6965 6e74 6966
2375120 6963 5f5f 5f5f 4531 3a31 312c 6669 7865 645f 5f5f 5f45 313a 3132 2c75 6e69 7462 7566 5f5f 5f5f 4531 3a31 332c 7374 6469
2375200 6f5f 5f5f 5f45 313a 3134 2c3b 005f 5f45 323a 5428 302c 3235 293d 6573 6b69 7070 696e 675f 5f5f 5f45 323a 302c 7469 6564
2375260 5f5f 5f5f 4532 3a31 2c3b 0069 6f73 3a54 2830 2c32 3629 3d73 3630 6e75 7365 725f 5f33 696f 733a 2830 2c31 292c 302c 3332
2375340 3b78 5f75 7365 725f 5f33 696f 733a 2830 2c33 3029 3d2a 2830 2c32 3729 3d78 7569 6f73 5f75 7365 725f 756e 696f 6e3a 2c33
2375420 322c 3332 3b62 705f 5f33 696f 733a 2830 2c33 3129 3d2a 2830 2c32 3829 3d78 7373 7472 6561 6d62 7566 3a2c 3634 2c33 323b
2375500 7374 6174 655f 5f33 696f 733a 2830 2c31 292c 3936 2c33 323b 6973 7065 6369 616c 5f5f 3369 6f73 3a28 302c 3129 2c31 3238
2375560 2c33 323b 6f73 7065 6369 616c 5f5f 3369 6f73 3a28 302c 3129 2c31 3630 2c33 323b 6973 6678 5f73 7065 6369 616c 5f5f 3369
2375640 6f73 3a28 302c 3129 2c31 3932 2c33 323b 6f73 6678 5f73 7065 6369 616c 5f5f 3369 6f73 3a28 302c 3129 2c32 3234 2c33 323b
2375720 5c00 6465 6c62 7566 5f5f 3369 6f73 3a28 302c 3129 2c32 3536 2c33 323b 785f 7469 655f 5f33 696f 733a 2830 2c33 3229 3d2a
2376000 2830 2c32 3929 3378 736f 7374 7265 616d 3a2c 3238 382c 3332 3b78 5f66 6c61 6773 5f5f 3369 6f73 3a28 302c 3129 2c33 3230
2376060 2c33 323b 785f 7072 6563 6973 696f 6e5f 5f33 696f 733a 2830 2c34 292c 3335 322c 3136 3b78 5f66 696c 6c5f 5f33 696f 733a
2376140 2830 2c32 292c 3336 382c 383b 785f 7769 6474 685f 5f33 696f 733a 2830 2c34 292c 3338 342c 3136 3b61 7373 6967 6e5f 7072
2376220 6976 6174 655f 5f33 696f 733a 2830 2c31 292c 3431 362c 3332 3b5f 5f76 7074 725f 5f33 696f 733a 2830 2c33 3329 3d2a 2830
2376300 2c31 3529 2c34 3438 2c33 323b 3b00 6261 7365 6669 656c 645f 5f33 696f 733a 4728 302c 3129 0061 646a 7573 7466 6965 6c64
2376360 5f5f 3369 6f73 3a47 2830 2c31 2900 666c 6f61 7466 6965 6c64 5f5f 3369 6f73 3a47 2830 2c31 2900 6e65 7874 6269 745f 5f33
2376440 696f 733a 4728 302c 3129 006e 6578 7477 6f72 645f 5f33 696f 733a 4728 302c 3129 0073 7464 696f 666c 7573 685f 5f33 696f

```
2376520  733a 4728 302c 3136 2900 696f 733a 5a63 696f 733b 3b5f 5f63 745f 5f33 696f 7346 5039 7374 7265 616d 6275 6620 5f5f 6374
2376600  5f5f 3369 6f73 4676 205f 5f63 745f 5f33 696f 7346 5233 696f 7320 5f5f 6474 5f5f 3369 6f73 4676 2066 6c61 6773 5f5f 3369
2376660  6f73 4676 2066 6c61 6773 5f5f 3369 6f73 466c 2073 6574 665f 5f33 696f 7346 6c54 3120 7365 7466 5f5f 3369 6f73 466c 2075
2376740  6e73 6574 665f 5f33 696f 7346 6c20 7769 6474 685f 5f33 696f 7346 7620 7769 6474 685f 5f33 696f 7346 6920 7469 655f 5f33
2377020  696f 7346 5037 6f73 7472 6561 6d20 5c00 7469 655f 5f33 696f 7346 7620 6669 6c6c 5f5f 3369 6f73 4663 2066 696c 6c5f 5f33
2377100  696f 7346 7620 7072 6563 6973 696f 6e5f 5f33 696f 7346 6920 7072 6563 6973 696f 6e5f 5f33 696f 7346 7620 7264 7374 6174
2377160  655f 5f33 696f 7346 7620 5f5f 6f70 5076 5f5f 3369 6f73 4676 205f 5f6e 745f 5f33 696f 7346 7620 656f 665f 5f33 696f 7346
2377240  7620 6661 696c 5f5f 3369 6f73 4676 2062 6164 5f5f 3369 6f73 4676 2067 6f6f 645f 5f33 696f 7346 7620 636c 6561 725f 5f33
2377320  696f 7346 6920 7264 6275 665f 5f33 696f 7346 7620 5c00 6977 6f72 645f 5f33 696f 7346 6920 7077 6f72 645f 5f33 696f 7346
2377400  6920 6269 7461 6c6c 6f63 5f5f 3369 6f73 5346 7620 7861 6c6c 6f63 5f5f 3369 6f73 5346 7620 7572 6573 697a 655f 5f33 696f
2377460  7346 6920 7379 6e63 5f77 6974 685f 7374 6469 6f5f 5f33 696f 7353 4676 2073 6574 7374 6174 655f 5f33 696f 7346 6920 696e
2377540  6974 5f5f 3369 6f73 4650 3973 7472 6561 6d62 7566 205f 5f61 735f 5f33 696f 7346 5233 696f 7320 736b 6970 5f5f 3369 6f73
2377620  4669 203b 6261 7365 6669 656c 645f 5f33 696f 7320 5c00 6164 6a75 7374 6669 656c 645f 5f33 696f 7320 666c 6f61 7466 6965
2377700  6c64 5f5f 3369 6f73 206e 6578 7462 6974 5f5f 3369 6f73 206e 6578 7477 6f72 645f 5f33 696f 7320 7374 6469 6f66 6c75 7368
2377760  5f5f 3369 6f73 203b 3b00 7374 7265 616d 6275 663a 5428 302c 3238 293d 7334 3061 6c6c 6f63 5f5f 3973 7472 6561 6d62 7566
2400040  3a28 302c 3429 2c30 2c31 363b 785f 756e 6275 665f 5f39 7374 7265 616d 6275 663a 2830 2c34 292c 3136 2c31 363b 785f 6261
2400120  7365 5f5f 3973 7472 6561 6d62 7566 3a28 302c 3230 292c 3332 2c33 323b 785f 7062 6173 655f 5f39 7374 7265 616d 6275 663a
2400200  2830 2c32 3029 2c36 342c 3332 3b78 5f70 7074 725f 5f39 7374 7265 616d 6275 663a 2830 2c32 3029 2c39 362c 3332 3b78 5f65
2400260  7070 7472 5f5f 3973 7472 6561 6d62 7566 3a28 302c 3230 292c 3132 382c 3332 3b78 5f67 7074 725f 5f39 7374 7265 616d 6275
2400340  663a 2830 2c32 3029 2c31 3630 2c33 323b 785f 6567 7074 725f 5f39 7374 7265 616d 6275 663a 2830 2c32 3029 2c31 3932 2c33
2400420  323b 5c00 785f 6562 6163 6b5f 5f39 7374 7265 616d 6275 663a 2830 2c32 3029 2c32 3234 2c33 323b 785f 626c 656e 5f5f 3973
2400500  7472 6561 6d62 7566 3a28 302c 3129 2c32 3536 2c33 323b 5f5f 7670 7472 5f5f 3973 7472 6561 6d62 7566 3a28 302c 3333 292c
2400560  3238 382c 3332 3b3b 0073 7472 6561 6d62 7566 3a5a 6373 7472 6561 6d62 7566 3b3b 5f5f 6374 5f5f 3973 7472 6561 6d62 7566
2400640  4652 3973 7472 6561 6d62 7566 205f 5f63 745f 5f39 7374 7265 616d 6275 6646 7620 5f5f 6374 5f5f 3973 7472 6561 6d62 7566
2400720  4650 6369 205f 5f63 745f 5f39 7374 7265 616d 6275 6646 5063 6954 3220 5f5f 6173 5f5f 3973 7472 6561 6d62 7566 4652 3973
2401000  7472 6561 6d62 7566 2064 6279 5f5f 3973 7472 6561 6d62 7566 4676 2062 6173 655f 5f39 7374 7265 616d 6275 6646 7620 7062
2401060  6173 655f 5f39 7374 7265 616d 6275 6646 7620 5c00 7070 7472 5f5f 3973 7472 6561 6d62 7566 4676 2065 7070 7472 5f5f 3973
2401140  7472 6561 6d62 7566 4676 2067 7074 725f 5f39 7374 7265 616d 6275 6646 7620 6567 7074 725f 5f39 7374 7265 616d 6275 6646
2401220  7620 6562 6163 6b5f 5f39 7374 7265 616d 6275 6646 7620 6562 7566 5f5f 3973 7472 6561 6d62 7566 4676 2062 6c65 6e5f 5f39
2401300  7374 7265 616d 6275 6646 7620 7365 7470 5f5f 3973 7472 6561 6d62 7566 4650 6354 3120 7365 7467 5f5f 3973 7472 6561 6d62
2401360  7566 4650 634e 3231 2070 6275 6d70 5f5f 3973 7472 6561 6d62 7566 4669 205c 0067 6275 6d70 5f5f 3973 7472 6561 6d62 7566
2401440  4669 2073 6574 625f 5f39 7374 7265 616d 6275 6646 5063 5431 6920 756e 6275 6666 6572 6564 5f5f 3973 7472 6561 6d62 7566
2401520  4676 2075 6e62 7566 6665 7265 645f 5f39 7374 7265 616d 6275 6646 6920 616c 6c6f 6361 7465 5f5f 3973 7472 6561 6d62 7566
2401600  4676 2064 6f61 6c6c 6f63 6174 655f 5f39 7374 7265 616d 6275 6646 7620 6f76 6572 666c 6f77 5f5f 3973 7472 6561 6d62 7566
2401660  4669 2075 6e64 6572 666c 6f77 5f5f 3973 7472 6561 6d62 7566 4676 205c 0070 6261 636b 6661 696c 5f5f 3973 7472 6561 6d62
2401740  7566 4669 2073 736e 635f 5f39 7374 7265 6161 6275 6646 7620 7365 656b 6f66 665f 5f39 7374 7265 616d 6275 6646 6c38 7365
2402020  656b 5f64 6972 6920 7365 656b 706f 735f 5f39 7374 7265 616d 6275 6646 6c69 2078 7370 7574 6e5f 5f39 7374 7265 616d 6275
2402100  6646 5043 6369 2078 7367 6574 6e5f 5f39 7374 7265 616d 6275 6646 5063 6920 696e 5f61 7661 696c 5f5f 3973 7472 6561 6d62
2402160  7566 4676 206f 7574 5f77 6169 7469 6e67 5f5f 3973 7472 6561 6d62 7566 4676 205c 0073 6765 7463 5f5f 3973 7472 6561 6d62
2402240  7566 4676 2073 6e65 7874 635f 5f39 7374 7265 616d 6275 6646 7620 7362 756d 7063 5f5f 3973 7472 6561 6d62 7566 4676 2073
2402320  746f 7373 635f 5f39 7374 7265 616d 6275 6646 7620 7370 7574 6261 636b 635f 5f39 7374 7265 616d 6275 6646 6320 7370 7574
2402400  635f 5f39 7374 7265 616d 6275 6646 6920 7370 7574 6e5f 5f39 7374 7265 616d 6275 6646 5043 6369 2073 6765 746e 5f5f 3973
2402460  7472 6561 6d62 7566 4650 6369 2073 6574 6275 665f 5f39 7374 7265 616d 6275 6646 5063 6920 5c00 7365 7462 7566 5f5f 3973
2402540  7472 6561 6d62 7566 4650 5563 6920 7365 7462 7566 5f5f 3973 7472 6561 6d62 7566 4650 6369 5432 205f 5f64 745f 5f39 7374
2402620  7265 616d 6275 6646 7620 785f 736e 6578 7463 5f5f 3973 7472 6561 6d62 7566 4676 203b 3b3b 0069 7374 7265 616d 3a54 2830
2402700  2c33 3429 3d73 3732 785f 6763 6f75 6e74 5f5f 3769 7374 7265 616d 3a28 302c 3129 2c30 2c33 323b 5f5f 7670 7472 5f5f 3769
2402760  7374 7265 616d 3a28 302c 3333 292c 3332 2c33 323b 5069 6f73 3a28 302c 3335 293d 2a28 302c 3236 292c 3634 2c33 323b 4f69
2403040  6f73 3a28 302c 3236 292c 3936 2c34 3830 3b3b 0069 7374 7265 616d 3a5a 6369 7374 7265 616d 3b69 6f73 3b5f 5f63 745f 5f37
2403120  6973 7472 6561 6d46 5039 7374 7265 616d 6275 6620 5f5f 6374 5f5f 3769 7374 7265 616d 4676 205f 5f63 745f 5f37 6973 7472
2403200  6561 6d46 5039 7374 7265 616d 6275 6669 5037 6f73 7472 6561 6d20 5f5f 6374 5f5f 3769 7374 7265 616d 4669 5063 5431 205f
2403260  5f63 745f 5f37 6973 7472 6561 6d46 6954 3150 376f 7374 7265 616d 205f 5f63 745f 5f37 6973 7472 6561 6d46 5237 6973 7472
2403340  6561 6d20 5f5f 6474 5f5f 3769 7374 7265 616d 4676 205c 0069 7066 785f 5f37 6973 7472 6561 6d46 6920 6973 6678 5f5f 3769
2403420  7374 7265 616d 4676 2073 6565 6b67 5f5f 3769 7374 7265 616d 466c 2073 6565 6b67 5f5f 3769 7374 7265 616d 466c 3873 6565
2403500  6b5f 6469 7220 7465 6c6c 675f 5f37 6973 7472 6561 6d46 7620 5f5f 7273 5f5f 3769 7374 7265 616d 4650 4652 3769 7374 7265
2403560  616d 5f52 3769 7374 7265 616d 205f 5f72 735f 5f37 6973 7472 6561 6d46 5046 5233 696f 735f 5233 696f 7320 5f5f 7273 5f5f
```

| | | | | | | | | | | | | | | | | | | | | | | | | |
|---|---|---|---|---|---|---|---|---|---|---|---|---|---|---|---|---|---|---|---|---|---|---|---|---|
| 2403640 | 3769 | 7374 | 7265 | 616d | 4650 | 6320 | 5f5f | 7273 | 5f5f | 3769 | 7374 | 7265 | 616d | 4650 | 5563 | 205c | 005f | 5f72 | 735f | 5f37 | 6973 | 7472 | 6561 | 6d46 |
| 2403720 | 5255 | 6320 | 5f5f | 7273 | 5f5f | 3769 | 7374 | 7265 | 616d | 4652 | 6320 | 5f5f | 7273 | 5f5f | 3769 | 7374 | 7265 | 616d | 4652 | 7320 | 5f5f | 7273 | 5f5f | 3769 |
| 2404000 | 7374 | 7265 | 616d | 4652 | 6920 | 5f5f | 7273 | 5f5f | 3769 | 7374 | 7265 | 616d | 4652 | 6c20 | 5f5f | 7273 | 5f5f | 3769 | 7374 | 7265 | 616d | 4652 | 5573 | 205f |
| 2404060 | 5f72 | 735f | 5f37 | 6973 | 7472 | 6561 | 6d46 | 5255 | 6920 | 5f5f | 7273 | 5f5f | 3769 | 7374 | 7265 | 616d | 4652 | 556c | 205f | 5f72 | 735f | 5f37 | 6973 | 7472 |
| 2404140 | 6561 | 6d46 | 5266 | 205f | 5f72 | 735f | 5f37 | 6973 | 7472 | 6561 | 6d46 | 5264 | 205f | 5f72 | 735f | 5f37 | 6973 | 7472 | 6561 | 6d46 | 5039 | 7374 | 7265 | 616d |
| 2404220 | 6275 | 6620 | 5c00 | 6765 | 745f | 5f37 | 6973 | 7472 | 6561 | 6d46 | 5063 | 6963 | 2067 | 6574 | 5f5f | 3769 | 7374 | 7265 | 616d | 4650 | 5563 | 6963 | 2067 | 6574 |
| 2404300 | 5f5f | 3769 | 7374 | 7265 | 616d | 4652 | 3973 | 7472 | 6561 | 6d62 | 7566 | 6320 | 6765 | 745f | 5f37 | 6973 | 7472 | 6561 | 6d46 | 5255 | 6320 | 6765 | 745f | 5f37 |
| 2404360 | 6973 | 7472 | 6561 | 6d46 | 5263 | 2067 | 6574 | 5f5f | 3769 | 7374 | 7265 | 616d | 4676 | 2067 | 6574 | 6c69 | 6e65 | 5f5f | 3769 | 7374 | 7265 | 616d | 4650 | 6369 |
| 2404440 | 6320 | 6765 | 746c | 696e | 655f | 5f37 | 6973 | 7472 | 6561 | 6d46 | 5055 | 6369 | 6320 | 7065 | 656b | 5f5f | 3769 | 7374 | 7265 | 616d | 4676 | 2069 | 676e | 6f72 |
| 2404520 | 655f | 5f37 | 6973 | 7472 | 6561 | 6d46 | 6954 | 3120 | 5c00 | 7265 | 6164 | 5f5f | 3769 | 7374 | 7265 | 616d | 4650 | 6369 | 2072 | 6561 | 645f | 5f37 | 6973 | 7472 |
| 2404600 | 6561 | 6d46 | 5055 | 6369 | 2067 | 636f | 756e | 745f | 5f37 | 6973 | 7472 | 6561 | 6d46 | 7620 | 7075 | 7462 | 6163 | 6b5f | 5f37 | 6973 | 7472 | 6561 | 6d46 | 6320 |
| 2404660 | 7379 | 6e63 | 5f5f | 3769 | 7374 | 7265 | 616d | 4676 | 2064 | 6f5f | 6970 | 6678 | 5f5f | 3769 | 7374 | 7265 | 616d | 4669 | 2065 | 6174 | 7768 | 6974 | 655f | 5f37 |
| 2404740 | 6973 | 7472 | 6561 | 6d46 | 7620 | 7867 | 6574 | 5f5f | 3769 | 7374 | 7265 | 616d | 4650 | 6320 | 3b3b | 3b00 | 6f73 | 7472 | 6561 | 6d3a | 5428 | 302c | 3239 | 293d |
| 2405020 | 7336 | 3a5f | 5f76 | 7074 | 725f | 5f37 | 6f73 | 7472 | 6561 | 6d3a | 2830 | 2c33 | 3329 | 2c30 | 2c33 | 323b | 5069 | 6f73 | 3a28 | 302c | 3335 | 292c | 3332 | 2c33 |
| 2405100 | 323b | 4f69 | 6f73 | 3a28 | 302c | 3236 | 292c | 3634 | 2c34 | 3930 | 3b3b | 006f | 7374 | 7265 | 616d | 3a5a | 636f | 7374 | 7265 | 616d | 3b69 | 6f73 | 3b5f | 5f63 |
| 2405160 | 745f | 5f37 | 6f73 | 7472 | 6561 | 6d46 | 5039 | 7374 | 7265 | 616d | 6275 | 6620 | 5f5f | 6374 | 5f5f | 376f | 7374 | 7265 | 616d | 4676 | 205f | 5f63 | 745f | 5f37 |
| 2405240 | 6f73 | 7472 | 6561 | 6d46 | 6920 | 5f5f | 6374 | 5f5f | 376f | 7374 | 7265 | 616d | 4669 | 5063 | 205f | 5f63 | 745f | 5f37 | 6f73 | 7472 | 6561 | 6d46 | 5237 | 6f73 |
| 2405320 | 7472 | 6561 | 6d20 | 5f5f | 6474 | 5f5f | 376f | 7374 | 7265 | 616d | 4676 | 206f | 7066 | 785f | 5f37 | 6f73 | 7472 | 6561 | 6d46 | 7620 | 6f73 | 6678 | 5f5f | 376f |
| 2405400 | 7374 | 7265 | 616d | 4676 | 2066 | 6c75 | 7368 | 5f5f | 376f | 7374 | 7265 | 616d | 4676 | 205c | 0073 | 6565 | 6b70 | 5f5f | 376f | 7374 | 7265 | 616d | 466c | 2073 |
| 2405460 | 6565 | 6b70 | 5f5f | 376f | 7374 | 7265 | 616d | 466c | 3873 | 6565 | 6b5f | 6469 | 7220 | 7465 | 6c6c | 705f | 5f37 | 6f73 | 7472 | 6561 | 6d46 | 7620 | 7075 | 745f |
| 2405540 | 5f37 | 6f73 | 7472 | 6561 | 6d46 | 6320 | 5f5f | 6c73 | 5f5f | 376f | 7374 | 7265 | 616d | 4663 | 205f | 5f6c | 735f | 5f37 | 6f73 | 7472 | 6561 | 6d46 | 5563 | 205f |
| 2405620 | 5f6c | 735f | 5f37 | 6f73 | 7472 | 6561 | 6d46 | 5043 | 6320 | 5f5f | 6c73 | 5f5f | 376f | 7374 | 7265 | 616d | 4669 | 205f | 5f6c | 735f | 5f37 | 6f73 | 7472 | 6561 |
| 2405700 | 6d46 | 6c20 | 5f5f | 6c73 | 5f5f | 376f | 7374 | 7265 | 616d | 4664 | 205f | 5f6c | 735f | 5f37 | 6f73 | 7472 | 6561 | 6d46 | 6620 | 5c00 | 5f5f | 6c73 | 5f5f | 376f |
| 2405760 | 7374 | 7265 | 616d | 4655 | 6920 | 5f5f | 6c73 | 5f5f | 376f | 7374 | 7265 | 616d | 4655 | 6c20 | 5f5f | 6c73 | 5f5f | 376f | 7374 | 7265 | 616d | 4650 | 7620 | 5f5f |
| 2406040 | 6c73 | 5f5f | 376f | 7374 | 7265 | 616d | 4650 | 3973 | 7472 | 6561 | 6d62 | 7566 | 205f | 5f6c | 735f | 5f37 | 6f73 | 7472 | 6561 | 6d46 | 7320 | 5f5f | 6c73 | 5f5f |
| 2406120 | 376f | 7374 | 7265 | 616d | 4655 | 7320 | 5f5f | 6c73 | 5f5f | 376f | 7374 | 7265 | 616d | 4650 | 4652 | 376f | 7374 | 7265 | 616d | 5f52 | 376f | 7374 | 7265 | 616d |
| 2406200 | 205f | 5f6c | 735f | 5f37 | 6f73 | 7472 | 6561 | 6d46 | 5046 | 5233 | 696f | 735f | 5233 | 696f | 7320 | 7772 | 6974 | 655f | 5f37 | 6f73 | 7472 | 6561 | 6d46 | 5043 |
| 2406260 | 6369 | 205c | 0077 | 7269 | 7465 | 5f5f | 376f | 7374 | 7265 | 616d | 4650 | 4355 | 6369 | 2064 | 6f5f | 6f70 | 6678 | 5f5f | 376f | 7374 | 7265 | 616d | 4676 | 2064 |
| 2406340 | 6f5f | 6f73 | 6678 | 5f5f | 376f | 7374 | 7265 | 616d | 4676 | 203b | 3b3b | 0070 | 7574 | 5f5f | 376f | 7374 | 7265 | 616d | 4663 | 3a66 | 2830 | 2c33 | 3629 | 3d2a |
| 2406420 | 2830 | 2c32 | 3929 | 005f | 5f30 | 7468 | 6973 | 3a70 | 2830 | 2c33 | 3629 | 005f | 5f30 | 633a | 7028 | 302c | 3229 | 002f | 7573 | 722f | 4343 | 2f73 | 756e | 342f |
| 2406500 | 696e | 636c | 2f69 | 6f73 | 7472 | 6561 | 6d2e | 6800 | 5f5f | 3074 | 6869 | 733a | 7228 | 302c | 3336 | 2900 | 5f5f | 3074 | 6869 | 7320 | 3a5a | 746c | 005f | 5f30 |
| 2406560 | 6320 | 3a5a | 746c | 0070 | 7574 | 5f5f | 376f | 7374 | 7265 | 616d | 4663 | 203a | 5a74 | 4600 | 696f | 7374 | 7265 | 616d | 3a54 | 2830 | 2c33 | 3729 | 3d73 | 3830 |
| 2406640 | 785f | 6763 | 6f75 | 6e74 | 5f5f | 3769 | 7374 | 7265 | 6161 | 3a28 | 302c | 3129 | 2c30 | 2c33 | 323b | 5f5f | 7670 | 7472 | 5f5f | 3769 | 7374 | 7265 | 616d | 3a28 |
| 2406720 | 302c | 3333 | 292c | 3332 | 2c33 | 323b | 5069 | 6f73 | 3a28 | 302c | 3335 | 292c | 3634 | 2c33 | 323b | 4f6f | 7374 | 7265 | 616d | 3a28 | 302c | 3239 | 292c | 3936 |
| 2407000 | 2c35 | 3434 | 3b3b | 0069 | 6f73 | 7472 | 6561 | 6d3a | 5a63 | 696f | 7374 | 7265 | 616d | 3b69 | 7374 | 7265 | 616d | 206f | 7374 | 7265 | 616d | 2069 | 6f73 | 3b5f |
| 2407060 | 5f63 | 745f | 5f38 | 696f | 7374 | 7265 | 616d | 4650 | 3973 | 7472 | 6561 | 6d62 | 7566 | 205f | 5f63 | 745f | 5f38 | 696f | 7374 | 7265 | 616d | 4676 | 205f | 5f63 |
| 2407140 | 745f | 5f38 | 696f | 7374 | 7265 | 616d | 4652 | 3869 | 6f73 | 7472 | 6561 | 6d20 | 5f5f | 6474 | 5f5f | 3869 | 6f73 | 7472 | 6561 | 6d46 | 7620 | 3b3b | 3b00 | 6369 |
| 2407220 | 6e3a | 4728 | 302c | 3339 | 293d | 7873 | 6973 | 7472 | 6561 | 6d5f | 7769 | 7468 | 6173 | 7369 | 676e | 3a00 | 636f | 7574 | 3a47 | 2830 | 2c33 | 3929 | 3d78 | 736f |
| 2407300 | 7374 | 7265 | 616d | 5f77 | 6974 | 6861 | 7373 | 6967 | 6e3a | 0063 | 6572 | 723a | 4728 | 302c | 3339 | 2900 | 636c | 6f67 | 3a47 | 2830 | 2c33 | 3929 | 0049 | 6f73 |
| 2407360 | 7472 | 6561 | 6d5f | 696e | 6974 | 3a54 | 2830 | 2c34 | 3029 | 3d73 | 315f | 5f57 | 395f | 5f31 | 3349 | 6f73 | 7472 | 6561 | 6d5f | 696e | 6974 | 3a28 | 302c | 3229 |
| 2407440 | 2c30 | 2c38 | 3b3b | 0073 | 7464 | 7374 | 6174 | 7573 | 5f5f | 3133 | 496f | 7374 | 7265 | 616d | 5f69 | 6e69 | 743a | 4728 | 302c | 3129 | 0069 | 6e69 | 7463 | 6f75 |
| 2407520 | 6e74 | 5f5f | 3133 | 496f | 7374 | 7265 | 616d | 5f69 | 6e69 | 743a | 4728 | 302c | 3129 | 0049 | 6f73 | 7472 | 6561 | 6d5f | 696e | 6974 | 3a5a | 6349 | 6f73 | 7472 |
| 2407600 | 6561 | 6d5f | 696e | 6974 | 3b3b | 5f5f | 6374 | 5f5f | 3133 | 496f | 7374 | 7265 | 616d | 5f69 | 6e69 | 7446 | 7620 | 5f5f | 6474 | 5f5f | 3133 | 496f | 7374 | 7265 |
| 2407660 | 616d | 5f69 | 6e69 | 7446 | 7620 | 3b73 | 7464 | 7374 | 6174 | 7573 | 5f5f | 3133 | 496f | 7374 | 7265 | 616d | 5f69 | 6e69 | 7420 | 696e | 6974 | 636f | 756e | 745f |
| 2407740 | 5f31 | 3349 | 6f73 | 7472 | 6561 | 6d5f | 696e | 6974 | 203b | 4069 | 6f73 | 3b00 | 696f | 7374 | 7265 | 616d | 5f69 | 6e69 | 743a | 5328 | 302c | 3430 | 2900 | 4750 |
| 2410020 | 543a | 7428 | 302c | 3133 | 2900 | 736d | 616e | 6970 | 5f69 | 6e74 | 3a54 | 2830 | 2c34 | 3129 | 3d73 | 3866 | 6374 | 5f5f | 3130 | 736d | 616e | 6970 | 5f69 | 6e74 |
| 2410100 | 3a28 | 302c | 3432 | 293d | 2a28 | 302c | 3433 | 293d | 6628 | 302c | 3335 | 292c | 302c | 3332 | 3b61 | 7267 | 5f5f | 3130 | 736d | 616e | 6970 | 5f69 | 6e74 | 3a28 |
| 2410160 | 302c | 3129 | 2c33 | 322c | 3332 | 3b3b | 0073 | 6d61 | 6e69 | 705f | 696e | 743a | 5a63 | 736d | 616e | 6970 | 5f69 | 6e74 | 3b3b | 5f5f | 6374 | 5f5f | 3130 | 736d |
| 2410240 | 616e | 6970 | 5f69 | 6e74 | 4650 | 4652 | 3369 | 6f73 | 695f | 5233 | 696f | 7369 | 203b | 3b5f | 5f6c | 735f | 5f46 | 5237 | 6f73 | 7472 | 6561 | 6d52 | 3130 | 736d |
| 2410320 | 616e | 6970 | 5f69 | 6e74 | 205f | 5f72 | 735f | 5f46 | 5237 | 6973 | 7472 | 6561 | 6d52 | 3130 | 736d | 616e | 6970 | 5f69 | 6e74 | 203b | 0073 | 6170 | 706c | 795f |
| 2410400 | 696e | 743a | 5428 | 302c | 3434 | 293d | 7334 | 6663 | 745f | 5f31 | 3073 | 6170 | 706c | 795f | 696e | 743a | 2830 | 2c34 | 3229 | 2c30 | 2c33 | 323b | 3b00 | 7361 |
| 2410460 | 7070 | 6c79 | 5f69 | 6e74 | 3a5a | 6373 | 6170 | 706c | 795f | 696e | 743b | 3b5f | 5f63 | 745f | 5f31 | 3073 | 6170 | 706c | 795f | 696e | 7446 | 5046 | 5233 | 696f |
| 2410540 | 7369 | 5f52 | 3369 | 6f73 | 205f | 5f63 | 6c5f | 5f31 | 3073 | 6170 | 706c | 795f | 696e | 7446 | 6920 | 3b3b | 3b00 | 696d | 616e | 6970 | 5f69 | 6e74 | 3a54 | 2830 |
| 2410620 | 2c34 | 3529 | 3d73 | 3866 | 6374 | 5f5f | 3130 | 696d | 616e | 6970 | 5f69 | 6e74 | 3a28 | 302c | 3436 | 293d | 2a28 | 302c | 3437 | 293d | 6628 | 302c | 3438 | 293d |
| 2410700 | 2a28 | 302c | 3334 | 292c | 302c | 3332 | 3b61 | 7267 | 5f5f | 3130 | 696d | 616e | 6970 | 5f69 | 6e74 | 3a28 | 302c | 3129 | 2c33 | 322c | 3332 | 3b3b | 0069 | 6d61 |

| | | | | | | | | | | | | | | | | | | | | | | | | |
|---|---|---|---|---|---|---|---|---|---|---|---|---|---|---|---|---|---|---|---|---|---|---|---|---|
| 2410760 | 6e69 | 705f | 696e | 743a | 5a63 | 696d | 616e | 6970 | 5f69 | 6e74 | 3b3b | 5f5f | 6374 | 5f5f | 3130 | 696d | 616e | 6970 | 5f69 | 6e74 | 4650 | 4652 | 3769 | 7374 |
| 2411040 | 7265 | 616d | 695f | 5237 | 6973 | 7472 | 6561 | 6d69 | 203b | 3b5f | 5f72 | 735f | 5f46 | 5237 | 6973 | 7472 | 6561 | 6d52 | 3130 | 696d | 616e | 6970 | 5f69 | 6e74 |
| 2411120 | 203b | 0069 | 6170 | 706c | 795f | 696e | 743a | 5428 | 302c | 3439 | 293d | 7334 | 6663 | 745f | 5f31 | 3069 | 6170 | 706c | 795f | 696e | 743a | 2830 | 2c34 | 3629 |
| 2411200 | 2c30 | 2c33 | 323b | 3b00 | 6961 | 7070 | 6c79 | 5f69 | 6e74 | 3a5a | 6369 | 6170 | 706c | 795f | 696e | 743b | 3b5f | 5f63 | 745f | 5f31 | 3069 | 6170 | 706c | 795f |
| 2411260 | 696e | 7446 | 5046 | 5237 | 6973 | 7472 | 6561 | 6d69 | 5f52 | 3769 | 7374 | 7265 | 616d | 205f | 5f63 | 6c5f | 5f31 | 3069 | 6170 | 706c | 795f | 696e | 7446 | 6920 |
| 2411340 | 3b3b | 3b00 | 6f6d | 616e | 6970 | 5f69 | 6e74 | 3a54 | 2830 | 2c35 | 3029 | 3d73 | 3866 | 6374 | 5f5f | 3130 | 6f6d | 616e | 6970 | 5f69 | 6e74 | 3a28 | 302c | 3531 |
| 2411420 | 293d | 2a28 | 302c | 3532 | 293d | 6628 | 302c | 3336 | 292c | 302c | 3332 | 3b61 | 7267 | 5f5f | 3130 | 6f6d | 616e | 6970 | 5f69 | 6e74 | 3a28 | 302c | 3129 | 2c33 |
| 2411500 | 322c | 3332 | 3b3b | 006f | 6d61 | 6e69 | 705f | 696e | 743a | 5a63 | 6f6d | 616e | 6970 | 5f69 | 6e74 | 3b3b | 5f5f | 6374 | 5f5f | 3130 | 6f6d | 616e | 6970 | 5f69 |
| 2411560 | 6e74 | 4650 | 4652 | 376f | 7374 | 7265 | 616d | 695f | 5237 | 6f73 | 7472 | 6561 | 6d69 | 203b | 3b5f | 5f6c | 735f | 5f46 | 5237 | 6f73 | 7472 | 6561 | 6d52 | 3130 |
| 2411640 | 6f6d | 616e | 6970 | 5f69 | 6e74 | 203b | 006f | 6170 | 706c | 795f | 696e | 743a | 5428 | 302c | 3533 | 293d | 7334 | 6663 | 745f | 5f31 | 306f | 6170 | 706c | 795f |
| 2411720 | 696e | 743a | 2830 | 2c35 | 3129 | 2c30 | 2c33 | 323b | 3b00 | 6f61 | 7070 | 6c79 | 5f69 | 6e74 | 3a5a | 636f | 6170 | 706c | 795f | 696e | 743b | 3b5f | 5f63 | 745f |
| 2412000 | 5f31 | 306f | 6170 | 706c | 795f | 696e | 7446 | 5046 | 5237 | 6f73 | 7472 | 6561 | 6d69 | 5f52 | 376f | 7374 | 7265 | 616d | 205f | 5f63 | 6c5f | 5f31 | 306f | 6170 |
| 2412060 | 706c | 795f | 696e | 7446 | 6920 | 3b3b | 3b00 | 696f | 6d61 | 6e69 | 705f | 696e | 743a | 5428 | 302c | 3534 | 293d | 7338 | 6663 | 745f | 5f31 | 3169 | 6f6d | 616e |
| 2412140 | 6970 | 5f69 | 6e74 | 3a28 | 302c | 3535 | 293d | 2a28 | 302c | 3536 | 293d | 6628 | 302c | 3537 | 293d | 2a28 | 302c | 3337 | 292c | 302c | 3332 | 3b61 | 7267 | 5f5f |
| 2412220 | 3131 | 696f | 6d61 | 6e69 | 705f | 696e | 743a | 2830 | 2c31 | 292c | 3332 | 2c33 | 323b | 3b00 | 696f | 6d61 | 6e69 | 705f | 696e | 743a | 5a63 | 696f | 6d61 | 6e69 |
| 2412300 | 705f | 696e | 743b | 3b5f | 5f63 | 745f | 5f31 | 3169 | 6f61 | 616e | 6970 | 5f69 | 6e74 | 4650 | 4652 | 3869 | 6f73 | 7472 | 6561 | 6d69 | 5f52 | 3869 | 6f73 | 7472 |
| 2412360 | 6561 | 6d69 | 203b | 3b5f | 5f6c | 735f | 5f46 | 5238 | 696f | 7374 | 7265 | 616d | 5231 | 3169 | 6f6d | 616e | 6970 | 5f69 | 6e74 | 205f | 5f72 | 735f | 5f46 | 5238 |
| 2412440 | 696f | 7374 | 7265 | 616d | 5231 | 3169 | 6f6d | 616e | 6970 | 5f69 | 6e74 | 203b | 0069 | 6f61 | 7070 | 6c79 | 5f69 | 6e74 | 3a54 | 2830 | 2c35 | 3829 | 3d73 | 3466 |
| 2412520 | 6374 | 5f5f | 3131 | 696f | 6170 | 706c | 795f | 696e | 743a | 2830 | 2c35 | 3529 | 2c30 | 2c33 | 323b | 3b00 | 696f | 6170 | 706c | 795f | 696e | 743a | 5a63 | 696f |
| 2412600 | 6170 | 706c | 795f | 696e | 743b | 3b5f | 5f63 | 745f | 5f31 | 3169 | 6f61 | 7070 | 6c79 | 5f69 | 6e74 | 4650 | 4652 | 3869 | 6f73 | 7472 | 6561 | 6d69 | 5f52 | 3869 |
| 2412660 | 6f73 | 7472 | 6561 | 6420 | 5f5f | 636c | 5f5f | 3131 | 696f | 6170 | 706c | 795f | 696e | 7446 | 6920 | 3b3b | 3b00 | 736d | 616e | 6970 | 5f6c | 6f6e | 673a | 5428 |
| 2412740 | 302c | 3539 | 293d | 7338 | 6663 | 745f | 5f31 | 3173 | 6d61 | 6e69 | 705f | 6c6f | 6e67 | 3a28 | 302c | 3432 | 292c | 302c | 3332 | 3b61 | 7267 | 5f5f | 3131 | 736d |
| 2413020 | 616e | 6970 | 5f6c | 6f6e | 673a | 2830 | 2c31 | 292c | 3332 | 2c33 | 323b | 3b00 | 736d | 616e | 6970 | 5f6c | 6f6e | 673a | 5a63 | 736d | 616e | 6970 | 5f6c | 6f6e |
| 2413100 | 673b | 3b5f | 5f63 | 745f | 5f31 | 3173 | 6d61 | 6e69 | 705f | 6c6f | 6e67 | 4650 | 4652 | 3369 | 6f73 | 6c5f | 5233 | 696f | 736c | 203b | 3b5f | 5f6c | 735f | 5f46 |
| 2413160 | 5237 | 6f73 | 7472 | 6561 | 6d52 | 3131 | 736d | 616e | 6970 | 5f6c | 6f6e | 6720 | 5f5f | 7273 | 5f5f | 4652 | 3769 | 7374 | 7265 | 616d | 5231 | 3173 | 6d61 | 6e69 |
| 2413240 | 705f | 6c6f | 6e67 | 203b | 0073 | 6170 | 706c | 795f | 6c6f | 6e67 | 3a54 | 2830 | 2c36 | 3029 | 3d73 | 3466 | 6374 | 5f5f | 3131 | 7361 | 7070 | 6c79 | 5f6c | 6f6e |
| 2413320 | 673a | 2830 | 2c34 | 3229 | 2c30 | 2c33 | 323b | 3b00 | 7361 | 7070 | 6c79 | 5f6c | 6f6e | 673a | 5a63 | 7361 | 7070 | 6c79 | 5f6c | 6f6e | 673b | 3b5f | 5f63 | 745f |
| 2413400 | 5f31 | 3173 | 6170 | 706c | 795f | 6c6f | 6e67 | 4650 | 4652 | 3369 | 6f73 | 6c5f | 5233 | 696f | 7320 | 5f5f | 636c | 5f5f | 3131 | 7361 | 7070 | 6c79 | 5f6c | 6f6e |
| 2413460 | 6746 | 6c20 | 3b3b | 3b00 | 696d | 616e | 6970 | 5f6c | 6f6e | 673a | 5428 | 302c | 3631 | 293d | 7338 | 6663 | 745f | 5f31 | 3169 | 6d61 | 6e69 | 705f | 6c6f | 6e67 |
| 2413540 | 3a28 | 302c | 3436 | 292c | 302c | 3332 | 3b61 | 7267 | 5f5f | 3131 | 696d | 616e | 6970 | 5f6c | 6f6e | 673a | 2830 | 2c31 | 292c | 3332 | 2c33 | 323b | 3b00 | 696d |
| 2413620 | 616e | 6970 | 5f6c | 6f6e | 673a | 5a63 | 696d | 616e | 6970 | 5f6c | 6f6e | 673b | 3b5f | 5f63 | 745f | 5f31 | 3169 | 6d61 | 6e69 | 705f | 6c6f | 6e67 | 4650 | 4652 |
| 2413700 | 3769 | 7374 | 7265 | 616d | 6c5f | 5237 | 6973 | 7472 | 6561 | 6d6c | 203b | 3b5f | 5f72 | 735f | 5f46 | 5237 | 6973 | 7472 | 6561 | 6d52 | 3131 | 696d | 616e | 6970 |
| 2413760 | 5f6c | 6f6e | 6720 | 3b00 | 6961 | 7070 | 6c79 | 5f6c | 6f6e | 673a | 5428 | 302c | 3632 | 293d | 7334 | 6663 | 745f | 5f31 | 3169 | 6170 | 706c | 795f | 6c6f | 6e67 |
| 2414040 | 3a28 | 302c | 3436 | 292c | 302c | 3332 | 3b3b | 0069 | 6170 | 706c | 795f | 6c6f | 6e67 | 3a5a | 6369 | 6170 | 706c | 795f | 6c6f | 6e67 | 3b3b | 5f5f | 6374 | 5f5f |
| 2414120 | 3131 | 6961 | 7070 | 6c79 | 5f6c | 6f6e | 6746 | 5046 | 5237 | 6973 | 7472 | 6561 | 6d6c | 5f52 | 3769 | 7374 | 7265 | 616d | 205f | 5f63 | 6c5f | 5f31 | 3169 | 6170 |
| 2414200 | 706c | 795f | 6c6f | 6e67 | 466c | 203b | 3b3b | 006f | 6d61 | 6e69 | 705f | 6c6f | 6e67 | 3a54 | 2830 | 2c36 | 3329 | 3d73 | 3866 | 6374 | 5f5f | 3131 | 6f6d | 616e |
| 2414260 | 6970 | 5f6c | 6f6e | 673a | 2830 | 2c35 | 3129 | 2c30 | 2c33 | 323b | 6172 | 675f | 5f31 | 316f | 6d61 | 6e69 | 705f | 6c6f | 6e67 | 3a28 | 302c | 3129 | 2c33 | 322c |
| 2414340 | 3332 | 3b3b | 006f | 6d61 | 6e69 | 705f | 6c6f | 6e67 | 3a5a | 636f | 6d61 | 6e69 | 705f | 6c6f | 6e67 | 3b3b | 5f5f | 6374 | 5f5f | 3131 | 6f6d | 616e | 6970 | 5f6c |
| 2414420 | 6f6e | 6746 | 5046 | 5237 | 6f73 | 7472 | 6561 | 6d6c | 5f52 | 376f | 7374 | 7265 | 616d | 6c20 | 3b3b | 5f5f | 6c73 | 5f5f | 4652 | 376f | 7374 | 7265 | 616d | 5231 |
| 2414500 | 316f | 6d61 | 6e69 | 705f | 6c6f | 6e67 | 203b | 006f | 6170 | 706c | 795f | 6c6f | 6e67 | 3a54 | 2830 | 2c36 | 3429 | 3d73 | 3466 | 6374 | 5f5f | 3131 | 6f61 | 7070 |
| 2414560 | 6c79 | 5f6c | 6f6e | 673a | 2830 | 2c35 | 3129 | 2c30 | 2c33 | 323b | 3b00 | 6f61 | 7070 | 6c79 | 5f6c | 6f6e | 673a | 5a63 | 6f61 | 7070 | 6c79 | 5f6c | 6f6e | 673b |
| 2414640 | 3b5f | 5f63 | 745f | 5f31 | 316f | 6170 | 706c | 795f | 6c6f | 6e67 | 4650 | 4652 | 376f | 7374 | 7265 | 616d | 6c5f | 5237 | 6f73 | 7472 | 6561 | 6d20 | 5f5f | 636c |
| 2414720 | 5f5f | 3131 | 6f61 | 7070 | 6c79 | 5f6c | 6f6e | 6746 | 6c20 | 3b3b | 3b00 | 696f | 6d61 | 6e69 | 705f | 6c6f | 6e67 | 3a54 | 2830 | 2c36 | 3529 | 3d73 | 3866 | 6374 |
| 2415000 | 5f5f | 3132 | 696f | 6d61 | 6e69 | 705f | 6c6f | 6e67 | 3a28 | 302c | 3535 | 292c | 302c | 3332 | 3b61 | 7267 | 5f5f | 3132 | 696f | 6d61 | 6e69 | 705f | 6c6f | 6e67 |
| 2415060 | 3a28 | 302c | 3129 | 2c33 | 322c | 3332 | 3b3b | 0069 | 6f6d | 616e | 6970 | 5f6c | 6f6e | 673a | 5a63 | 696f | 6d61 | 6e69 | 705f | 6c6f | 6e67 | 3b3b | 5f5f | 6374 |
| 2415140 | 5f5f | 3132 | 696f | 6d61 | 6e69 | 705f | 6c6f | 6e67 | 4650 | 4652 | 3869 | 6f73 | 7472 | 6561 | 6d6c | 5f52 | 3869 | 6f73 | 7472 | 6561 | 6d6c | 203b | 3b5f | 5f6c |
| 2415220 | 735f | 5f46 | 5238 | 696f | 7374 | 7265 | 616d | 5231 | 3269 | 6f6d | 616e | 6970 | 5f6c | 6f6e | 6720 | 5f5f | 7273 | 5f5f | 4652 | 3869 | 6f73 | 7472 | 6561 | 6d52 |
| 2415300 | 3132 | 696f | 6d61 | 6e69 | 705f | 6c6f | 6e67 | 203b | 0069 | 6f61 | 7070 | 6c79 | 5f6c | 6f6e | 673a | 5428 | 302c | 3636 | 293d | 7334 | 6663 | 745f | 5f31 | 3269 |
| 2415360 | 6f61 | 7070 | 6c79 | 5f6c | 6f6e | 673a | 2830 | 2c35 | 3529 | 2c30 | 2c33 | 323b | 3b00 | 696f | 6170 | 706c | 795f | 6c6f | 6e67 | 3a5a | 6369 | 6f61 | 7070 | 6c79 |
| 2415440 | 5f6c | 6f6e | 673b | 3b5f | 5f63 | 745f | 5f31 | 3269 | 6f61 | 7070 | 6c79 | 5f6c | 6f6e | 6746 | 5046 | 5238 | 696f | 7374 | 7265 | 616d | 6c5f | 5238 | 696f | 7374 |
| 2415520 | 7265 | 616d | 205f | 5f63 | 6c5f | 5f31 | 3269 | 6f61 | 7070 | 6c79 | 5f6c | 6f6e | 6746 | 6c20 | 3b3b | 3b00 | 7374 | 6469 | 6f62 | 7566 | 3a54 | 2830 | 2c36 | 3729 |
| 2415600 | 3d73 | 3532 | 616c | 6c6f | 635f | 5f39 | 7374 | 7265 | 616d | 6275 | 663a | 2830 | 2c34 | 292c | 302c | 3136 | 3b78 | 5f75 | 6e62 | 7566 | 5f5f | 3973 | 7472 | 6561 |
| 2415660 | 6d62 | 7566 | 3a28 | 302c | 3429 | 2c31 | 362c | 3136 | 3b78 | 5f62 | 6173 | 655f | 5f39 | 7374 | 7265 | 616d | 6275 | 663a | 2830 | 2c32 | 3029 | 2c33 | 322c | 3332 |
| 2415740 | 3b78 | 5f70 | 6261 | 7365 | 5f5f | 3973 | 7472 | 6561 | 6462 | 7566 | 3a28 | 302c | 3230 | 292c | 3634 | 2c33 | 323b | 785f | 7070 | 7472 | 5f5f | 3973 | 7472 | 6561 |
| 2416020 | 6d62 | 7566 | 3a28 | 302c | 3230 | 292c | 3936 | 2c33 | 323b | 785f | 6570 | 7074 | 725f | 5f39 | 7374 | 7265 | 616d | 6275 | 663a | 2830 | 2c32 | 3029 | 2c31 | 3238 |

| | | | | | | | | | | | | | | | | | | | | | | | | |
|---|---|---|---|---|---|---|---|---|---|---|---|---|---|---|---|---|---|---|---|---|---|---|---|---|
| 2416100 | 2c33 | 323b | 785f | 6770 | 7472 | 5f5f | 3973 | 7472 | 6561 | 6d62 | 7566 | 3a28 | 302c | 3230 | 292c | 3136 | 302c | 3332 | 3b78 | 5f65 | 6770 | 7472 | 5f5f | 3973 |
| 2416160 | 7472 | 6561 | 6d62 | 7566 | 3a28 | 302c | 3230 | 292c | 3139 | 322c | 3332 | 3b5c | 0078 | 5f65 | 6261 | 636b | 5f5f | 3973 | 7472 | 6561 | 6d62 | 7566 | 3a28 | 302c |
| 2416240 | 3230 | 292c | 3232 | 342c | 3332 | 3b78 | 5f62 | 6c65 | 6e5f | 5f39 | 7374 | 7265 | 616d | 6275 | 663a | 2830 | 2c31 | 292c | 3235 | 362c | 3332 | 3b5f | 5f76 | 7074 |
| 2416320 | 725f | 5f39 | 7374 | 7265 | 616d | 6275 | 663a | 2830 | 2c33 | 3329 | 2c32 | 3838 | 2c33 | 323b | 6670 | 5f5f | 3873 | 7464 | 696f | 6275 | 663a | 2830 | 2c36 | 3829 |
| 2416400 | 3d2a | 2830 | 2c31 | 3029 | 3d78 | 735f | 696f | 6275 | 663a | 2c33 | 3230 | 2c33 | 323b | 6c61 | 7374 | 5f6f | 705f | 5f38 | 7374 | 6469 | 6f62 | 7566 | 3a28 | 302c |
| 2416460 | 3129 | 2c33 | 3532 | 2c33 | 323b | 6275 | 665f | 5f38 | 7374 | 6469 | 6f62 | 7566 | 3a28 | 302c | 3639 | 293d | 6172 | 2830 | 2c31 | 293b | 303b | 313b | 2830 | 2c32 |
| 2416540 | 292c | 3338 | 342c | 3136 | 3b3b | 0073 | 7464 | 696f | 6275 | 663a | 5a63 | 7374 | 6469 | 6f62 | 7566 | 3b73 | 7472 | 6561 | 6d62 | 7566 | 3b6f | 7665 | 7266 | 6c6f |
| 2416620 | 775f | 5f38 | 7374 | 6469 | 6f62 | 7566 | 4669 | 2075 | 6e64 | 6572 | 666c | 6f77 | 5f5f | 3873 | 7464 | 696f | 6275 | 6646 | 7620 | 7379 | 6e63 | 5f5f | 3873 | 7464 |
| 2416700 | 696f | 6275 | 6646 | 7620 | 7365 | 656b | 6f66 | 665f | 5f38 | 7374 | 6469 | 6f62 | 7566 | 466c | 3873 | 6565 | 6b5f | 6469 | 7269 | 2070 | 6261 | 636b | 6661 | 696c |
| 2416760 | 5f5f | 3873 | 7464 | 696f | 6275 | 6646 | 6920 | 5f5f | 6374 | 5f5f | 3873 | 7464 | 696f | 6275 | 6646 | 5036 | 5f69 | 6f62 | 7566 | 205f | 5f63 | 745f | 5f38 | 7374 |
| 2417040 | 6469 | 6f62 | 7566 | 4652 | 4338 | 7374 | 6469 | 6f62 | 7566 | 205c | 0073 | 7464 | 696f | 6669 | 6c65 | 5f5f | 3873 | 7464 | 696f | 6275 | 6646 | 7620 | 5f5f | 6474 |
| 2417120 | 5f5f | 3973 | 7464 | 696f | 6275 | 6646 | 7620 | 3b3b | 3b00 | 6669 | 6c65 | 6275 | 663a | 5428 | 302c | 3730 | 293d | 7336 | 3461 | 6c6c | 6f63 | 5f5f | 3973 | 7472 |
| 2417200 | 6561 | 6d62 | 7566 | 3a28 | 302c | 3429 | 2c30 | 2c31 | 363b | 785f | 756e | 6275 | 665f | 5f39 | 7374 | 7265 | 616d | 6275 | 663a | 2830 | 2c34 | 292c | 3136 | 2c31 |
| 2417260 | 363b | 785f | 6261 | 7365 | 5f5f | 3973 | 7472 | 6561 | 6d62 | 7566 | 3a28 | 302c | 3230 | 292c | 3332 | 2c33 | 323b | 785f | 7062 | 6173 | 655f | 5f39 | 7374 | 7265 |
| 2417340 | 616d | 6275 | 663a | 2830 | 2c32 | 3029 | 2c36 | 342c | 3332 | 3b78 | 5f70 | 7074 | 725f | 5f39 | 7374 | 7265 | 616d | 6275 | 663a | 2830 | 2c32 | 3029 | 2c39 | 362c |
| 2417420 | 3332 | 3b78 | 5f65 | 7070 | 7472 | 5f5f | 3973 | 7472 | 6561 | 6d62 | 7566 | 3a28 | 302c | 3230 | 292c | 3132 | 382c | 3332 | 3b78 | 5f67 | 7074 | 725f | 5f39 | 7374 |
| 2417500 | 7265 | 616d | 6275 | 663a | 2830 | 2c32 | 3029 | 2c31 | 3630 | 2c33 | 323b | 785f | 6567 | 7074 | 725f | 5f39 | 7374 | 7265 | 616d | 6275 | 663a | 2830 | 2c32 | 3029 |
| 2417560 | 2c31 | 3932 | 2c33 | 323b | 5c00 | 785f | 6562 | 6163 | 6b5f | 5f39 | 7374 | 7265 | 616d | 6275 | 663a | 2830 | 2c32 | 3029 | 2c32 | 3234 | 2c33 | 323b | 785f | 626c |
| 2417640 | 656e | 5f5f | 3973 | 7472 | 6561 | 6d62 | 7566 | 3a28 | 302c | 3129 | 2c32 | 3536 | 2c33 | 323b | 5f5f | 7670 | 7472 | 5f5f | 3973 | 7472 | 6561 | 6d62 | 7566 | 3a28 |
| 2417720 | 302c | 3333 | 292c | 3238 | 382c | 3332 | 3b78 | 6664 | 5f5f | 3766 | 696c | 6562 | 7566 | 3a28 | 302c | 3129 | 2c33 | 3230 | 2c33 | 323b | 6d6f | 6465 | 5f5f | 3766 |
| 2420000 | 696c | 6562 | 7566 | 3a28 | 302c | 3129 | 2c33 | 3532 | 2c33 | 323b | 6f70 | 656e | 6564 | 5f5f | 3766 | 696c | 6562 | 7566 | 3a28 | 302c | 3229 | 2c33 | 3834 | 2c38 |
| 2420060 | 3b6c | 6173 | 745f | 7365 | 656b | 5f5f | 3766 | 696c | 6562 | 7566 | 3a28 | 302c | 3129 | 2c34 | 3136 | 2c33 | 323b | 696e | 5f73 | 7461 | 7274 | 5f5f | 3766 | 696c |
| 2420140 | 6562 | 7566 | 3a28 | 302c | 3230 | 292c | 3434 | 382c | 3332 | 3b6c | 6168 | 6561 | 645f | 5f37 | 6669 | 6c65 | 6275 | 663a | 2830 | 2c36 | 3929 | 2c34 | 3830 | 2c31 |
| 2420220 | 363b | 3b00 | 6f70 | 656e | 7072 | 6f74 | 5f5f | 3766 | 696c | 6562 | 7566 | 3a47 | 2830 | 2c31 | 2900 | 6669 | 6c65 | 6275 | 663a | 5a63 | 6669 | 6c65 | 6275 | 663b |
| 2420300 | 7374 | 7265 | 616d | 6275 | 663b | 5f5f | 6374 | 5f5f | 3766 | 696c | 6562 | 7566 | 4676 | 205f | 5f63 | 745f | 5f37 | 6669 | 6c65 | 6275 | 6646 | 6920 | 5f5f | 6374 |
| 2420360 | 5f5f | 3766 | 696c | 6562 | 7566 | 4669 | 5063 | 5431 | 205f | 5f63 | 745f | 5f37 | 6669 | 6c65 | 6275 | 6646 | 5243 | 3766 | 696c | 6562 | 7566 | 2069 | 735f | 6f70 |
| 2420440 | 656e | 5f5f | 3766 | 696c | 6562 | 7566 | 4676 | 2066 | 645f | 5f37 | 6669 | 6c65 | 6275 | 6646 | 7620 | 6f70 | 656e | 5f5f | 3766 | 696c | 6562 | 7566 | 4650 | 4363 |
| 2420520 | 6954 | 3220 | 6174 | 7461 | 6368 | 5f5f | 3766 | 696c | 6562 | 7566 | 4669 | 2063 | 6c6f | 7365 | 5f5f | 3766 | 696c | 6562 | 7566 | 4676 | 205c | 005f | 5f64 | 745f |
| 2420600 | 5f37 | 6669 | 6c65 | 6275 | 6646 | 7620 | 6f76 | 6572 | 666c | 6f77 | 5f5f | 3766 | 696c | 6562 | 7566 | 4669 | 2075 | 6e64 | 6572 | 666c | 6f77 | 5f5f | 3766 | 696c |
| 2420660 | 6562 | 7566 | 4676 | 2073 | 796e | 635f | 5f37 | 6669 | 6c65 | 6275 | 6646 | 7620 | 7365 | 656b | 6f66 | 665f | 5f37 | 6669 | 6c65 | 6275 | 6646 | 6c38 | 7365 | 656b |
| 2420740 | 5f64 | 6972 | 6920 | 7365 | 7462 | 7566 | 5f5f | 3766 | 696c | 6562 | 7566 | 4650 | 6369 | 206c | 6173 | 745f | 6f70 | 5f5f | 3766 | 696c | 6562 | 7566 | 4676 | 203b |
| 2421020 | 6f70 | 656e | 7072 | 6f74 | 5f5f | 3766 | 696c | 6562 | 7566 | 203b | 3b00 | 6673 | 7472 | 6561 | 6d62 | 6173 | 653a | 5428 | 302c | 3731 | 293d | 7331 | 3332 | 6275 |
| 2421100 | 665f | 5f31 | 3166 | 7374 | 7265 | 616d | 6261 | 7365 | 3a28 | 302c | 3730 | 292c | 302c | 3531 | 323b | 5f5f | 7670 | 7472 | 5f5f | 3131 | 6673 | 7472 | 6561 | 6d62 |
| 2421160 | 6173 | 653a | 2830 | 2c33 | 3329 | 2c35 | 3132 | 2c33 | 323b | 5069 | 6f73 | 3a28 | 302c | 3335 | 292c | 3534 | 342c | 3332 | 3b4f | 696f | 733a | 2830 | 2c32 | 3629 |
| 2421240 | 2c35 | 3736 | 2c34 | 3930 | 3b3b | 0066 | 7374 | 7265 | 616d | 6261 | 7365 | 3a5a | 6366 | 7374 | 7265 | 616d | 6261 | 7365 | 3b69 | 6f73 | 3b5f | 5f63 | 745f | 5f31 |
| 2421320 | 3166 | 7374 | 7265 | 616d | 6261 | 7365 | 4676 | 205f | 5f63 | 745f | 5f31 | 3166 | 7374 | 7265 | 616d | 6261 | 7365 | 4650 | 4363 | 6954 | 3220 | 5f5f | 6374 | 5f5f |
| 2421400 | 3131 | 6673 | 7472 | 6561 | 6d62 | 6173 | 6546 | 6920 | 5f5f | 6374 | 5f5f | 3131 | 6673 | 7472 | 6561 | 6d62 | 6173 | 6546 | 6950 | 6354 | 3120 | 5f5f | 6374 | 5f5f |
| 2421460 | 3131 | 6673 | 7472 | 6561 | 6d62 | 6173 | 6546 | 5231 | 3165 | 7374 | 7265 | 616d | 6261 | 7365 | 205f | 5f64 | 745f | 5f31 | 3166 | 7374 | 7265 | 616d | 6261 | 7365 |
| 2421540 | 4676 | 206f | 7365 | 6e5f | 5f31 | 3166 | 7374 | 7265 | 616d | 6261 | 7365 | 4650 | 4363 | 6954 | 3220 | 5c00 | 6174 | 7461 | 6368 | 5f5f | 3131 | 6673 | 7472 | 6561 |
| 2421620 | 6d62 | 6173 | 6546 | 6920 | 636c | 6f73 | 655f | 5f31 | 3166 | 7374 | 7265 | 616d | 6261 | 7365 | 4676 | 2073 | 6574 | 6275 | 665f | 5f31 | 3166 | 7374 | 7265 | 616d |
| 2421700 | 6261 | 7365 | 4650 | 6369 | 2072 | 6462 | 7566 | 5f5f | 3131 | 6673 | 7472 | 6561 | 6d62 | 6173 | 6546 | 7620 | 7665 | 7269 | 6679 | 5f5f | 3131 | 6673 | 7472 | 6561 |
| 2421760 | 6d62 | 6173 | 6546 | 6920 | 3b3b | 3b00 | 7374 | 6174 | 655f | 7661 | 6c75 | 653a | 7428 | 302c | 3231 | 2900 | 4f62 | 6a65 | 6374 | 3a54 | 2830 | 2c37 | 3229 | 3d73 |
| 2422040 | 345f | 5f76 | 7074 | 725f | 5f36 | 4f62 | 6a65 | 6374 | 3a28 | 302c | 3333 | 292c | 302c | 3332 | 3b3b | 004f | 626a | 6563 | 743a | 5a63 | 4f62 | 6a65 | 6374 | 3b3b |
| 2422120 | 5f5f | 6374 | 5f5f | 364f | 626a | 6563 | 7446 | 7620 | 5f5f | 6374 | 5f5f | 364f | 626a | 6563 | 7446 | 5243 | 364f | 626a | 6563 | 7420 | 6572 | 726f | 724d | 656d |
| 2422200 | 6f72 | 795f | 5f36 | 4f62 | 6a65 | 6374 | 4650 | 6354 | 3120 | 6578 | 706c | 6169 | 6e5f | 5f36 | 4f62 | 6a65 | 6374 | 4650 | 6320 | 696e | 4f72 | 6465 | 725f | 5f36 |
| 2422260 | 4f62 | 6a65 | 6374 | 4650 | 364f | 526a | 6563 | 7420 | 3b3b | 3b00 | 5f5f | 7074 | 626c | 5f5f | 364f | 626a | 6563 | 745f | 5f62 | 6c6f | 636b | 5f63 | 7878 | 3a47 |
| 2422340 | 2830 | 2c33 | 3329 | 0050 | 463a | 7429 | 302c | 3135 | 2900 | 5046 | 433a | 7428 | 302c | 3135 | 2900 | 5046 | 493a | 7428 | 302c | 3135 | 2900 | 4e4f | 626a | 6563 |
| 2422420 | 743a | 5428 | 302c | 3733 | 293d | 7338 | 5f5f | 7670 | 7472 | 5f5f | 364f | 626a | 6563 | 743a | 2830 | 2c33 | 3329 | 2c30 | 2c33 | 323b | 6e61 | 6d65 | 5f5f | 374e |
| 2422500 | 4f62 | 6a65 | 6374 | 3a28 | 302c | 3230 | 292c | 3332 | 2c33 | 323b | 3b00 | 4e4f | 626a | 6563 | 743a | 5a63 | 4e4f | 626a | 6563 | 743b | 4f62 | 6a65 | 6374 | 3b5f |
| 2422560 | 5f63 | 745f | 5f37 | 4e4f | 626a | 6563 | 7446 | 5063 | 205f | 5f63 | 745f | 5f37 | 4e4f | 626a | 6563 | 7446 | 5243 | 374e | 4f62 | 6a65 | 6374 | 2073 | 6574 | 4e61 |
| 2422640 | 6d65 | 5f5f | 374e | 4f62 | 6a65 | 6374 | 4650 | 6320 | 6765 | 744e | 616d | 655f | 5f37 | 4e4f | 626a | 6563 | 7446 | 7620 | 6578 | 706c | 6169 | 6e5f | 5f37 | 4e4f |
| 2422720 | 626a | 6563 | 7446 | 5063 | 2067 | 6574 | 4174 | 7472 | 5f5f | 374e | 4f62 | 6a65 | 6374 | 4669 | 2067 | 6574 | 5072 | 6f70 | 5f5f | 374e | 4f62 | 6a65 | 6374 | 4650 |
| 2423000 | 6369 | 2073 | 6574 | 5072 | 6f70 | 5f5f | 374e | 4f62 | 6a65 | 6374 | 4650 | 6354 | 3120 | 5c00 | 7365 | 7450 | 726f | 705f | 5f37 | 4e4f | 626a | 6563 | 7446 | 5063 |
| 2423060 | 6920 | 7365 | 7450 | 726f | 705f | 5f37 | 4e4f | 626a | 6563 | 7446 | 5063 | 6620 | 6973 | 4754 | 455f | 5f37 | 4e4f | 626a | 6563 | 7446 | 5036 | 4f62 | 6a65 | 6374 |
| 2423140 | 2069 | 734c | 5445 | 5f5f | 374e | 4f62 | 6a65 | 6374 | 4650 | 364f | 626a | 6563 | 7420 | 3b3b | 3b00 | 6f73 | 7472 | 6561 | 6d5f | 7769 | 7468 | 6173 | 7369 | 676e |

```
2423220  3a54 2830 2c33 3929 3d73 3638 5f5f 7670 7472 5f5f 376f 7374 7265 616d 3a28 302c 3333 292c 302c 3332 3b50 696f 733a 2830
2423300  2c33 3529 2c33 322c 3332 3b4f 696f 733a 2830 2c32 3629 2c36 342c 3438 303b 3b00 6f73 7472 6561 6d5f 7769 7468 6173 7369
2423360  676e 3a5a 636f 7374 7265 616d 5f77 6974 6861 7373 6967 6e3b 6f73 7472 6561 6d20 696f 733b 5f5f 6374 5f5f 3138 6f73 7472
2423440  6561 6d5f 7769 7468 6173 7369 676e 4676 205f 5f63 745f 5f31 386f 7374 7265 616d 5f77 6974 6861 7373 6967 6e46 5231 386f
2423520  7374 7265 616d 5f77 6974 6861 7373 6967 6e20 5f5f 6474 5f5f 3138 6f73 7472 6561 6d5f 7769 7468 6173 7369 676e 4676 205f
2423600  5f61 735f 5f31 396f 7374 7265 616d 5f77 6974 6861 7373 6967 6e46 5237 6f73 7472 6561 6d20 5c00 5f5f 6173 5f5f 3138 6f73
2423660  7472 6561 6d5f 7769 7468 6173 7369 676e 4650 3973 7472 6561 6d62 7566 203b 3b3b 0050 4642 3a74 2830 2c31 3529 004c 4e4f
2423740  626a 6563 743a 5428 302c 3734 293d 7331 325f 5f76 7074 725f 5f36 4f62 6a65 6374 3a28 302c 3333 292c 302c 3332 3b6e 616d
2424020  655f 5f37 4e4f 626a 6563 743a 2830 2c32 3029 2c33 322c 3332 3b6e 6578 745f 5f38 4c4e 4f62 6a65 6374 3a28 302c 3735 293d
2424100  2a28 302c 3734 292c 3634 2c33 323b 3b00 4c4e 4f62 6a65 6374 3a5a 634c 4e4f 626a 6563 743b 4e4f 626a 6563 743b 5f5f 6374
2424160  5f5f 384c 4e4f 626a 6563 7446 5063 5038 4c4e 4f62 6a65 6374 205f 5f63 745f 5f38 4c4e 4f62 6a65 6374 4652 4338 4c4e 4f62
2424240  6a65 6374 2073 6574 4e65 7874 5f5f 384c 4e4f 626a 6563 7446 5039 4c4e 4f62 6a65 6374 2067 6574 4e65 7874 5f5f 384c 4e4f
2424320  626a 6563 7446 7620 3b3b 3b00 4c4f 626a 6563 743a 5428 302c 3736 293d 7338 5f5f 7670 7472 5f5f 364f 626a 6563 743a 2830
2424400  2c33 3329 2c30 2c33 323b 6e65 7874 5f5f 374c 4f62 6a65 6374 3a28 302c 3737 293d 2a28 302c 3736 292c 3332 2c33 323b 3b00
2424460  4c4f 626a 6563 743a 5a63 4c4f 626a 6563 743b 4f62 6a65 6374 3b5f 5f63 745f 5f37 4c4f 626a 6563 7446 5037 4c4f 626a 6563
2424540  7420 5f5f 6374 5f5f 374c 4f62 6a65 6374 4652 4337 4c4f 626a 6563 7420 7365 744e 6578 745f 5f37 4c4f 626a 6563 7446 5037
2424620  4c4f 626a 6563 7420 6765 744e 6578 745f 5f37 4c4f 626a 6563 7446 7620 3b3b 3b00 4c50 4f62 6a65 6374 3a54 2830 2c37 3829
2424700  3d73 3132 5f5f 7670 7472 5f5f 364f 626a 6563 743a 2830 2c33 3329 2c30 2c33 323b 6e65 7874 5f5f 374c 4f62 6a65 6374 3a28
2424760  302c 3737 292c 3332 2c33 323b 6e6f 626a 7074 725f 5f38 4c50 4f62 6a65 6374 3a28 302c 3739 293d 2a28 302c 3733 292c 3634
2425040  2c33 323b 3b00 4c50 4f62 6a65 6374 3a5a 634c 504f 626a 6563 743b 4c4f 626a 6563 743b 5f5f 6374 5f5f 384c 504f 626a 6563
2425120  7446 5037 4e4f 626a 6563 7450 374c 4f62 6a65 6374 205f 5f63 745f 5f38 4c50 4f62 6a65 6374 4652 4338 4c50 4f62 6a65 6374
2425200  2073 6574 4f62 6a65 6374 5f5f 384c 504f 6261 6563 7446 5037 4e4f 626a 6563 7420 6765 744f 626a 6563 745f 5f38 4c50 4f62
2425260  6a65 6374 4676 2065 7870 6c61 696e 5f5f 384c 504f 626a 6563 7446 5063 203b 3b3b 005f 5f70 7462 6c5f 5f38 4c50 4f62 6a65
2425340  6374 5f5f 626c 6f63 6b5f 6378 783a 4728 302c 3333 2900 4c69 7374 3a54 2830 2c38 3029 3d73 3132 636f 756e 745f 5f34 4c69
2425420  7374 3a28 302c 3129 2c30 2c33 323b 7074 724c 4f62 6a65 6374 5f5f 344c 6973 743a 2830 2c37 3729 2c33 322c 3332 3b5f 5f76
2425500  7074 725f 5f34 4c69 7374 3a28 302c 3333 292c 3634 2c33 323b 3b00 4c69 7374 3a5a 634c 6973 743b 3b5f 5f63 745f 5f34 4c69
2425560  7374 4676 205f 5f63 745f 5f34 4c69 7374 4652 4334 4c69 7374 205f 5f64 745f 5f34 4c69 7374 4676 2067 6574 436f 756e 745f
2425640  5f34 4c69 7374 4676 2067 6574 546f 705f 5f34 4c69 7374 4676 2073 6574 546f 705f 5f34 4c69 7374 4650 374c 4f62 6a65 6374
2425720  2065 7272 6f72 4d65 6d6f 7279 5f5f 344c 6973 7446 5063 5431 2062 726f 6164 6361 7374 5f5f 344c 6973 7446 4d36 4f62 6a65
2426000  6374 4676 5f76 2065 7870 6c61 696e 5f5f 344c 6973 7446 5063 205c 0069 6e73 6572 745f 5f34 4c69 7374 4650 374c 4f62 6a65
2426060  6374 2069 734d 656d 6265 725f 5f34 4c69 7374 4650 374c 4f62 6a65 6374 2069 734d 656d 6265 725f 5f34 4c69 7374 4650 6320
2426140  6973 4571 7561 6c5f 5f34 4c69 7374 4652 344c 6973 7420 7265 6d6f 7665 5f5f 344c 6973 7446 5063 203b 3b3b 005f 5f70 7462
2426220  6c5f 5f34 4c69 7374 5f5f 626c 6f63 6b5f 6378 783a 4728 302c 3333 2900 504c 6973 743a 5428 302c 3831 293d 7331 3263 6f75
2426300  6e74 5f5f 344c 6973 743a 2830 2c31 292c 302c 3332 3b70 7472 4c4f 626a 6563 745f 5f34 4c69 7374 3a28 302c 3737 292c 3332
2426360  2c33 323b 5f5f 7670 7472 5f5f 344c 6973 743a 2830 2c33 3329 2c36 342c 3332 3b3b 0050 4c69 7374 3a5a 6350 4c69 7374 3b4c
2426440  6973 743b 696e 7365 7274 5f5f 3550 4c69 7374 4650 384c 504f 626a 6563 7420 696e 7365 7274 5f5f 3550 4c69 7374 4652 3550
2426520  4c69 7374 2053 6f72 745f 504c 6973 745f 5f35 504c 6973 7446 6920 7265 7665 7273 655f 5f35 504c 6973 7446 7620 696e 7365
2426600  7274 4166 7465 725f 5f35 504c 6973 7446 5038 4c50 4f62 6a65 6374 5431 2072 656d 6f76 655f 5f35 504c 6973 7446 5038 4c50
2426660  4f62 6a65 6374 2072 656d 6f76 655f 5f35 504c 6973 7446 5063 2069 734d 656d 6265 725f 5f35 504c 6973 7446 5063 205c 0069
2426740  734d 656d 6265 725f 5f35 504c 6973 7446 5037 4c4f 626a 6563 7420 6973 4571 7561 6c5f 5f35 504c 6973 7446 5234 4c69 7374
2427020  2065 7870 6c61 696e 5f5f 3550 4c69 7374 4650 6320 5f5f 6374 5f5f 3550 4c69 7374 4652 4335 504c 6973 7420 5f5f 6374 5f5f
2427100  3550 4c69 7374 4676 203b 3b3b 005f 5f70 7462 6c5f 5f35 504c 6973 745f 5f62 6c6f 636b 5f63 7878 3a47 2830 2c33 3329 004c
2427160  6973 7449 7465 7261 746f 723a 5428 302c 3832 293d 7338 6c69 7374 5f5f 3132 4c69 7374 4974 6572 6174 6f72 3a28 302c 3833
2427240  293d 2a28 302c 3830 292c 302c 3332 3b70 5f5f 3132 4c69 7374 4974 6572 6174 6f72 3a28 302c 3737 292c 3332 2c33 323b 3b00
2427320  4c69 7374 4974 6572 6174 6f72 3a5a 634c 6973 7449 7465 7261 746f 723b 3b5f 5f63 745f 5f31 324c 6973 7449 7465 7261 746f
2427400  7246 5234 4c69 7374 2072 6573 6574 5f5f 3132 4c69 7374 4974 6572 6174 6f72 4676 2061 7474 6163 685f 5f31 324c 6973 7449
2427460  7465 7261 746f 7246 5234 4c69 7374 2067 6574 4375 7272 656e 745f 5f31 324c 6973 7449 7465 7261 746f 7246 7620 5f5f 7070
2427540  5f5f 3132 4c69 7374 4974 6572 6174 6f72 4676 203b 3b3b 0056 616c 7565 5f54 7970 653a 5428 302c 3834 293d 6555 4e4b 4e4f
2427620  574e 563a 302c 5354 5249 4e47 3a31 2c49 4e54 4547 4552 3a32 2c46 4c4f 4154 3a33 2c3b 0042 6c6f 636b 5f54 7970 653a 5428
2427700  302c 3835 293d 6555 4e4b 4e4f 574e 423a 302c 454e 5449 5459 3a31 2c46 554e 4354 494f 4e3a 322c 5052 4f43 4544 5552 453a
2427760  332c 3b00 456e 7469 7479 5f54 7970 653a 5428 302c 3836 293d 6555 4e4b 4e4f 574e 453a 302c 4152 4348 4954 4543 5455 5245
2430040  3a31 2c53 5542 5052 4f47 5241 4d3a 322c 1b00 5069 6e5f 5479 7065 3a54 2830 2c38 3729 3d65 554e 4b4e 4f57 4e50 3a30 2c49
2430120  4e50 494e 3a31 2c4f 5554 5049 4e3a 322c 494e 4f55 5450 494e 3a33 2c3b 0050 6172 615f 436c 6173 733a 5428 302c 3838 293d
2430200  6555 4e4b 4e4f 574e 433a 302c 464f 524d 414c 3a31 2c41 4354 5541 4c3a 322c 5245 534f 4c56 4544 3a33 2c3b 0042 4f4f 4c45
2430260  414e 3a54 2830 2c38 3929 3d65 4661 6c73 653a 302c 5472 7565 3a31 2c3b 0042 6f6f 6c65 616e 3a54 2830 2c39 3029 3d65 6661
```

| | | | | | | | | | | | | | | | | | | | | | | | | |
|---|---|---|---|---|---|---|---|---|---|---|---|---|---|---|---|---|---|---|---|---|---|---|---|---|
| 2430340 | 6c73 | 653a | 302c | 7472 | 7565 | 3a31 | 2c3b | 0042 | 7566 | 6665 | 723a | 4728 | 302c | 3230 | 2900 | 5069 | 6e4c | 656e | 6774 | 683a | 5428 | 302c | 3931 | 293d |
| 2430420 | 7331 | 365f | 5f76 | 7074 | 725f | 5f36 | 4f62 | 6a65 | 6374 | 3a28 | 302c | 3333 | 292c | 302c | 3332 | 3b6e | 616d | 655f | 5f37 | 4e4f | 626a | 6563 | 743a | 2830 |
| 2430500 | 2c32 | 3029 | 2c33 | 322c | 3332 | 3b43 | 6c65 | 6e67 | 7468 | 5f5f | 3950 | 696e | 4c65 | 6e67 | 7468 | 3a28 | 302c | 3230 | 292c | 3634 | 2c33 | 323b | 496c | 656e |
| 2430560 | 6774 | 685f | 5f39 | 5069 | 6e4c | 656e | 6774 | 683a | 2830 | 2c31 | 292c | 3936 | 2c33 | 323b | 3b00 | 5069 | 6e4c | 656e | 6774 | 683a | 5a63 | 5069 | 6e4c | 656e |
| 2430640 | 6774 | 683b | 4e4f | 626a | 6563 | 743b | 5f5f | 6374 | 5f5f | 3950 | 696e | 4c65 | 6e67 | 7468 | 4650 | 6354 | 3120 | 5f5f | 6374 | 5f5f | 3950 | 696e | 4c65 | 6e67 |
| 2430720 | 7468 | 4652 | 4339 | 5069 | 6e4c | 656e | 6774 | 6820 | 7365 | 745f | 5069 | 6e4c | 656e | 6774 | 685f | 5f39 | 5069 | 6e4c | 656e | 6774 | 6846 | 5063 | 5431 | 2067 |
| 2431000 | 6574 | 5f49 | 5f50 | 696e | 4c65 | 6e67 | 7468 | 5f5f | 3950 | 696e | 4c65 | 6e67 | 7468 | 4676 | 2067 | 6574 | 5f49 | 5f50 | 696e | 4c65 | 6e67 | 7468 | 5f5f | 3950 |
| 2431060 | 696e | 4c65 | 6e67 | 7468 | 4669 | 203b | 3b3b | 004d | 6f64 | 4765 | 6e3a | 5428 | 302c | 3932 | 293d | 7332 | 3442 | 6974 | 5769 | 6474 | 685f | 5f36 | 4d6f | 6447 |
| 2431140 | 656e | 3a28 | 302c | 3129 | 2c30 | 2c33 | 323b | 4553 | 7461 | 7465 | 5f5f | 364d | 6f64 | 4765 | 6e3a | 2830 | 2c39 | 3029 | 2c33 | 322c | 3332 | 3b50 | 696e | 4e61 |
| 2431220 | 6d65 | 4c65 | 6e67 | 7468 | 5f5f | 364d | 6f64 | 4765 | 6e3a | 2830 | 2c38 | 3129 | 2c36 | 342c | 3936 | 3b5f | 5f76 | 7074 | 725f | 5f36 | 4d6f | 6447 | 656e | 3a28 |
| 2431300 | 302c | 3333 | 292c | 3136 | 302c | 3332 | 3b3b | 004d | 6f64 | 4765 | 6e3a | 5a63 | 4d6f | 6447 | 656e | 3b3b | 5f5f | 6374 | 5f5f | 364d | 6f64 | 4765 | 6e46 | 7620 |
| 2431360 | 5f5f | 6374 | 5f5f | 364d | 6f64 | 4765 | 6e46 | 5243 | 364d | 6f64 | 4765 | 6e20 | 7365 | 745f | 4269 | 7457 | 6964 | 7468 | 5f5f | 364d | 6f64 | 4765 | 6e46 | 6920 |
| 2431440 | 7365 | 745f | 4553 | 7461 | 7465 | 5f5f | 364d | 6f64 | 4765 | 6e46 | 3742 | 6f6f | 6c65 | 616e | 2067 | 6574 | 5f45 | 5374 | 6174 | 655f | 5f36 | 4d6f | 6447 | 656e |
| 2431520 | 4676 | 2073 | 6574 | 5f50 | 696e | 4c65 | 6e67 | 7468 | 5f5f | 364d | 6f64 | 4765 | 6e46 | 5063 | 5431 | 2067 | 6574 | 5f50 | 696e | 4c65 | 6e67 | 7468 | 5f5f | 364d |
| 2431600 | 6f64 | 4765 | 6e46 | 5063 | 2073 | 6574 | 496e | 6465 | 785f | 5f36 | 4d6f | 6447 | 656e | 4676 | 205c | 0073 | 6574 | 4e61 | 6d65 | 496e | 6465 | 785f | 5f36 | 4d6f |
| 2431660 | 6447 | 656e | 4650 | 6320 | 4c6f | 6164 | 5f56 | 4844 | 4c5f | 4461 | 7461 | 5f5f | 364d | 6f64 | 4765 | 6e46 | 5037 | 4e4f | 626a | 6563 | 7420 | 436f | 6d70 | 6f73 |
| 2431740 | 655f | 4d6f | 6447 | 656e | 5f44 | 6573 | 6372 | 6970 | 746f | 725f | 5f36 | 4d6f | 6447 | 656e | 4650 | 6320 | 6578 | 706c | 6169 | 6e5f | 5f36 | 4d6f | 6447 | 656e |
| 2432020 | 4676 | 205f | 5f64 | 745f | 5f36 | 4d6f | 6447 | 656e | 4676 | 203b | 3b3b | 005f | 5f70 | 7462 | 6c5f | 5f36 | 4d6f | 6447 | 656e | 5f5f | 626c | 6f63 | 6b5f | 6378 |
| 2432100 | 783a | 4728 | 302c | 3333 | 2900 | 494f | 5f4d | 616e | 6167 | 6572 | 3a54 | 2830 | 2c39 | 3329 | 3d73 | 3336 | 6966 | 705f | 5f31 | 3049 | 4f5f | 4d61 | 6e61 | 6765 |
| 2432160 | 723a | 2830 | 2c36 | 3929 | 2c30 | 2c33 | 323b | 6f66 | 705f | 5f31 | 3049 | 4f5f | 4d61 | 6e61 | 6765 | 723a | 2830 | 2c36 | 3829 | 2c33 | 322c | 3332 | 3b6d | 6670 |
| 2432240 | 5f5f | 3130 | 494f | 5f4d | 616e | 6167 | 6572 | 3a28 | 302c | 3638 | 292c | 3634 | 2c33 | 323b | 6366 | 705f | 5f31 | 3049 | 4f5f | 4d61 | 6e61 | 6765 | 723a | 2830 |
| 2432320 | 2c36 | 3829 | 2c39 | 362c | 3332 | 3b49 | 4669 | 6c65 | 4e61 | 6165 | 5f5f | 3130 | 494f | 5f4d | 616e | 6167 | 6572 | 3a28 | 302c | 3230 | 292c | 3132 | 382c | 3332 |
| 2432400 | 3b4f | 4669 | 6c65 | 4e61 | 6d65 | 5f5f | 3130 | 494f | 5f4d | 616e | 6167 | 6572 | 3a28 | 302c | 3230 | 292c | 3136 | 302c | 3332 | 3b4d | 4669 | 6c65 | 4e61 | 6d65 |
| 2432460 | 5f5f | 3130 | 494f | 5f4d | 616e | 6167 | 6572 | 3a28 | 302c | 3230 | 292c | 3139 | 322c | 3332 | 3b43 | 4669 | 6c65 | 4e61 | 6d65 | 5f5f | 3130 | 494f | 5f4d | 616e |
| 2432540 | 6167 | 6572 | 3a28 | 302c | 3230 | 292c | 3232 | 342c | 3332 | 3b63 | 754c | 696e | 655f | 5f31 | 3049 | 4f5f | 4d61 | 6e61 | 6765 | 723a | 2830 | 2c31 | 292c | 3235 |
| 2432620 | 362c | 3332 | 3b3b | 0049 | 4f5f | 4d61 | 6e61 | 6765 | 723a | 5a63 | 494f | 5f4d | 616e | 6167 | 6572 | 3b3b | 5f5f | 6374 | 5f5f | 3130 | 494f | 5f4d | 616e | 6167 |
| 2432700 | 6572 | 4650 | 6320 | 5f5f | 6474 | 5f5f | 3130 | 494f | 5f4d | 616e | 6167 | 6572 | 4676 | 2049 | 4f43 | 6865 | 636b | 5f5f | 3130 | 494f | 5f4d | 616e | 6167 | 6572 |
| 2432760 | 4676 | 2043 | 6f70 | 7946 | 696c | 6554 | 6f4c | 696e | 655f | 5f31 | 3049 | 4f5f | 4d61 | 6e61 | 6765 | 7246 | 6920 | 436f | 7079 | 4669 | 6c65 | 546f | 456e | 645f |
| 2433040 | 5f31 | 3043 | 4f5f | 4d61 | 6e61 | 6765 | 7246 | 7620 | 5374 | 6174 | 6d65 | 6e74 | 4961 | 6e64 | 6c65 | 6572 | 5f5f | 3130 | 494f | 5f4d | 616e | 6167 | 6572 | 4650 |
| 2433120 | 6354 | 3169 | 205c | 0043 | 6f70 | 7946 | 696c | 6554 | 6f4b | 6579 | 575f | 5f31 | 3049 | 4f5f | 4d61 | 6e61 | 6765 | 7246 | 5063 | 5431 | 2045 | 6174 | 5f53 | 7461 |
| 2433200 | 7465 | 6d65 | 6e74 | 5f5f | 3130 | 494f | 5f4d | 616e | 6167 | 6572 | 4650 | 6354 | 3120 | 575f | 4f75 | 7446 | 696c | 655f | 5f31 | 3049 | 4f5f | 4d61 | 6e61 | 6765 |
| 2433260 | 7246 | 5063 | 2057 | 5f4d | 4669 | 6c65 | 5f5f | 3130 | 494f | 5f4d | 616e | 6167 | 6572 | 4650 | 6320 | 575f | 4346 | 696c | 655f | 5f31 | 3049 | 4f5f | 4d61 | 6e61 |
| 2433340 | 6765 | 7246 | 5063 | 203b | 3b3b | 005f | 5f43 | 3535 | 3a54 | 2830 | 2c39 | 3429 | 3d75 | 3473 | 7661 | 6c75 | 653a | 2830 | 2c32 | 3029 | 2c30 | 2c33 | 323b | 6976 |
| 2433420 | 616c | 7565 | 3a28 | 302c | 3129 | 2c30 | 2c33 | 323b | 6676 | 616c | 7565 | 3a28 | 302c | 3929 | 2c30 | 2c33 | 323b | 3b00 | 5f5f | 4335 | 353a | 5a63 | 5f5f | 4335 |
| 2433500 | 353b | 3b3b | 3b3b | 0047 | 656e | 5661 | 6c75 | 653a | 5428 | 302c | 3935 | 293d | 7331 | 365f | 5f76 | 7074 | 725f | 5f36 | 4f62 | 6a65 | 6374 | 3a28 | 302c | 3333 |
| 2433560 | 292c | 302c | 3332 | 3b6e | 616d | 655f | 5f37 | 4e4f | 626a | 6563 | 743a | 2830 | 2c32 | 3029 | 2c33 | 322c | 3332 | 3b74 | 7970 | 655f | 5f38 | 4765 | 6e56 | 616c |
| 2433640 | 7565 | 3a28 | 302c | 3834 | 292c | 3634 | 2c33 | 323b | 5f5f | 4f35 | 355f | 5f38 | 4765 | 6e56 | 616c | 7565 | 3a28 | 302c | 3934 | 292c | 3936 | 2c33 | 323b | 3b00 |
| 2433720 | 4765 | 6e56 | 616c | 7565 | 3a5a | 6347 | 656e | 5661 | 6c75 | 653b | 4e4f | 626a | 6563 | 743b | 5f5f | 6374 | 5f5f | 3847 | 656e | 5661 | 6c75 | 6546 | 7620 | 5f5f |
| 2434000 | 6374 | 5f5f | 3847 | 656e | 5661 | 6c75 | 6546 | 5243 | 3847 | 656e | 5661 | 6c75 | 6520 | 5f5f | 6474 | 5f5f | 3847 | 656e | 5661 | 6c75 | 6546 | 7620 | 7365 | 745f |
| 2434060 | 4765 | 6e56 | 616c | 7565 | 5f74 | 7970 | 655f | 5f38 | 4765 | 6e56 | 616c | 7565 | 4650 | 6369 | 2073 | 6574 | 5f47 | 656e | 5661 | 6c75 | 655f | 7479 | 7065 | 5f5f |
| 2434140 | 3847 | 656e | 5661 | 6c75 | 6546 | 3130 | 5661 | 6c75 | 555f | 5479 | 7065 | 2073 | 6574 | 5f47 | 656e | 5661 | 6c75 | 655f | 5f38 | 4765 | 6e56 | 616c | 7565 | 4650 |
| 2434220 | 6320 | 5c00 | 7365 | 745f | 4765 | 6e56 | 616c | 7565 | 5f5f | 3847 | 656e | 5661 | 6c75 | 6546 | 6920 | 7365 | 745f | 4765 | 6e56 | 616c | 7565 | 5f5f | 3847 | 656e |
| 2434300 | 5661 | 6c75 | 6546 | 6620 | 6765 | 745f | 4765 | 6e56 | 616c | 7565 | 5f74 | 7970 | 655f | 5f38 | 4765 | 6e56 | 616c | 7565 | 4676 | 2067 | 6574 | 5f47 | 656e | 5661 |
| 2434360 | 6c75 | 655f | 735f | 5f38 | 4765 | 6e56 | 616c | 7565 | 4676 | 2067 | 6574 | 5f47 | 656e | 5661 | 6c75 | 655f | 695f | 5f38 | 4765 | 6e56 | 616c | 7565 | 4676 | 2067 |
| 2434440 | 6574 | 5f47 | 656e | 5661 | 6c75 | 655f | 665f | 5f38 | 4765 | 6e56 | 616c | 7565 | 4676 | 2065 | 7870 | 6c61 | 696e | 5f5f | 3947 | 656e | 5661 | 6c75 | 6546 | 5063 |
| 2434520 | 205c | 0063 | 6865 | 636b | 5f5f | 3847 | 656e | 5661 | 6c75 | 6546 | 6920 | 3b3b | 3b00 | 5f5f | 7074 | 626c | 5f5f | 3847 | 656e | 5661 | 6c75 | 655f | 5f62 | 6c6f |
| 2434600 | 636b | 5f63 | 7879 | 3a47 | 2830 | 2c33 | 3329 | 0070 | 6172 | 616d | 6574 | 6572 | 3a54 | 2830 | 2c39 | 3629 | 3d73 | 3630 | 5f5f | 7670 | 7472 | 5f5f | 364f | 626a |
| 2434660 | 6563 | 743a | 2830 | 2c33 | 3329 | 2c30 | 2c33 | 323b | 6e61 | 6d65 | 5f5f | 374e | 4f62 | 6a65 | 6374 | 3a28 | 302c | 3230 | 292c | 3332 | 2c33 | 323b | 6e61 | 6d65 |
| 2434740 | 5f5f | 3970 | 6172 | 616d | 6574 | 6572 | 3a28 | 302c | 3230 | 292c | 3634 | 2c33 | 323b | 7479 | 7065 | 5f5f | 3970 | 6172 | 616d | 6574 | 6572 | 3a28 | 302c | 3230 |
| 2435020 | 292c | 3936 | 2c33 | 323b | 7261 | 6e67 | 655f | 5f39 | 7061 | 7261 | 6d65 | 7465 | 723a | 2830 | 2c32 | 3029 | 2c31 | 3238 | 2c33 | 323b | 736c | 6963 | 655f | 5f39 |
| 2435100 | 7061 | 7261 | 6d65 | 7465 | 723a | 2830 | 2c32 | 3029 | 2c31 | 3630 | 2c33 | 323b | 536c | 6f77 | 5f5f | 3970 | 6172 | 616d | 6574 | 6572 | 3a28 | 302c | 3129 | 2c31 |
| 2435160 | 3932 | 2c33 | 323b | 5368 | 6967 | 685f | 5f39 | 7061 | 7261 | 6d65 | 7465 | 723a | 2830 | 2c31 | 292c | 3232 | 342c | 3332 | 3b5c | 0050 | 436c | 6173 | 735f | 5f39 |
| 2435240 | 7061 | 7261 | 6d65 | 7465 | 723a | 2830 | 2c38 | 3829 | 2c32 | 3536 | 2c33 | 323b | 5058 | 5265 | 665f | 5f39 | 7061 | 7261 | 6d65 | 7465 | 723a | 2830 | 2c39 | 3729 |
| 2435320 | 3d2a | 2830 | 2c39 | 3629 | 2c32 | 3838 | 2c33 | 323b | 6d6f | 6465 | 5f5f | 3970 | 6172 | 616d | 6574 | 6572 | 3a28 | 302c | 3837 | 292c | 3332 | 302c | 3332 | 3b76 |
| 2435400 | 616c | 7565 | 5f5f | 3970 | 6172 | 616d | 6574 | 6572 | 3a28 | 302c | 3935 | 292c | 3335 | 322c | 3132 | 383b | 3b00 | 7061 | 7261 | 6d65 | 7465 | 723a | 5a63 | 7061 |

```
2435460 7261 6d65 7465 723b 4e4f 626a 6563 743b 5f5f 6374 5f5f 3970 6172 616d 6574 6572 4676 205f 5f63 745f 5f39 7061 7261 6d65
2435540 7465 7246 5243 3970 6172 616d 6574 6572 205f 5f64 745f 5f39 7061 7261 6d65 7465 7246 7620 6765 745f 7061 7261 6d65 7465
2435620 725f 6d6f 6465 5f5f 3970 6172 616d 6574 6572 4676 2067 6574 5f70 6172 616d 6574 6572 5f63 6c61 7373 5f5f 3970 6172 616d
2435700 6574 6572 4676 2067 6574 5f70 6172 615f 736c 6f77 5f5f 3970 6172 616d 6574 6572 4676 205c 0067 6574 5f70 6172 615f 7368
2435760 6967 685f 5f39 7061 7261 6d65 7465 7246 7620 6765 745f 7061 7261 6d65 7465 725f 7261 6e67 655f 5f39 7061 7261 6d65 7465
2436040 7246 7620 6765 745f 7061 7261 6165 7465 725f 7479 7065 5f5f 3970 6172 616d 6574 6572 4676 2067 6574 5f70 6172 616d 6574
2436120 6572 5f6e 616d 655f 5f39 7061 7261 6d65 7465 7246 7620 6765 745f 7061 7261 6d65 7465 725f 736c 6963 655f 5f39 7061 7261
2436200 6d65 7465 7246 7620 6765 745f 7061 7261 6d65 7465 725f 5058 5245 465f 5f39 7061 7261 6d65 7465 7246 3130 5061 7261 5f43
2436260 6c61 7373 205c 0067 6574 5f63 6f72 7265 6374 5f6c 656e 6774 685f 5f39 7061 7261 6d65 7465 7246 7620 6765 745f 7061 7261
2436340 5f6c 656e 6774 685f 5f39 7061 7261 6d65 7465 7246 7620 6765 745f 7061 7261 5f73 7461 7475 735f 5f39 7061 7261 6d65 7465
2436420 7246 7620 6765 745f 7061 7261 6165 7465 725f 7661 6c75 655f 5f39 7061 7261 6d65 7465 7246 7620 6765 745f 7061 7261 6d65
2436500 7465 725f 7661 6c75 655f 7479 7065 5f5f 3970 6172 616d 6574 6572 4676 2067 6574 5f70 6172 616d 6574 6572 5f73 7661 6c75
2436560 655f 5f39 7061 7261 6d65 7465 7246 7620 5c00 6765 745f 7061 7261 6d65 7465 725f 6976 616c 7565 5f5f 3970 6172 616d 6574
2436640 6572 4676 2067 6574 5f70 6172 616d 6574 6572 5f66 7661 6c75 655f 5f39 7061 7261 6d65 7465 7246 7620 7365 745f 7061 7261
2436720 6d65 7465 725f 6e61 6d65 5f5f 3970 6172 616d 6574 6572 4650 6320 7365 745f 7061 7261 6d65 7465 725f 636c 6173 735f 5f39
2437000 7061 7261 6d65 7465 7246 3130 5061 7261 5f43 6c61 7373 2073 6574 5f70 6172 616d 6574 6572 5f74 7970 655f 5f39 7061 7261
2437060 6d65 7465 7246 5063 2073 6574 5f70 6172 616d 6574 6572 5f73 6c69 6365 5f5f 3970 6172 616d 6574 6572 4650 6320 5c00 7365
2437140 745f 7061 7261 6165 7465 725f 7372 616e 6765 5f5f 3970 6172 616d 6574 6572 4650 6320 7365 745f 7061 7261 6d65 7465 725f
2437220 5058 5265 665f 5f39 7061 7261 6d65 7465 7246 5063 5035 626c 6f63 6b20 7365 745f 7061 7261 6d65 7465 725f 7261 6e67 655f
2437300 5f39 7061 7261 6165 7465 7246 5063 2073 6574 5f70 6172 616d 6574 6572 5f6d 6f64 655f 5f39 7061 7261 6d65 7465 7246 5063
2437360 2073 6574 5f70 6172 616d 6574 6572 5f76 616c 7565 5f5f 3970 6172 616d 6574 6572 4650 6320 7365 745f 7061 7261 6d65 7465
2437440 725f 7661 6c75 655f 5f39 7061 7261 6d65 7465 7246 6920 5c00 7365 745f 7061 7261 6d65 7465 725f 7661 6c75 655f 5f39 7061
2437520 7261 6d65 7465 7246 6620 7365 745f 7061 7261 6d65 7465 725f 7661 6c75 655f 7479 7065 5f5f 3970 6172 616d 6574 6572 4650
2437600 6320 6765 745f 5648 444c 5f46 6f72 6d61 6c5f 5061 7261 6d5f 5f39 7061 7261 6d65 7465 7246 5063 6920 6765 745f 5648 444c
2437660 5f50 726d 7472 5f5f 3970 6172 616d 6574 6572 4650 6369 2067 6574 5f56 4844 4c5f 4578 7061 6e64 6564 5f46 6f72 6d61 6c5f
2437740 5961 7261 6d5f 5f39 7061 7261 6d65 7465 7246 5035 626c 6f63 6b50 6369 205c 0067 6574 5f56 4844 4c5f 4578 7061 6e64 6564
2440020 5f50 726d 7472 5f4d 6170 5f5f 3970 6172 616d 6574 6572 4650 3562 6c6f 636b 5063 6920 6578 706c 6169 6e5f 5f39 7061 7261
2440100 6d65 7465 7246 5063 203b 3b3b 005f 5f70 7462 6c5f 5f39 7061 7261 6d65 7465 725f 5f62 6c6f 636b 5f63 7878 3a47 2830 2c33
2440160 3329 0062 6c6f 636b 5f61 7474 7269 6275 7465 733a 5428 302c 3938 293d 7332 385f 5f76 7074 725f 5f36 4f62 6a65 6374 3a28
2440240 302c 3333 292c 302c 3332 3b6e 616d 655f 5f37 4e4f 626a 6563 743a 2830 2c32 3029 2c33 322c 3332 3b6e 616d 655f 5f31 3662
2440320 6c6f 636b 5f61 7474 7269 6275 7465 733a 2830 2c32 3029 2c36 342c 3332 3b76 616c 7565 5f5f 3136 626c 6f63 6b5f 6174 7472
2440400 6962 7574 6573 3128 302c 3935 292c 3936 2c31 3238 3b3b 0062 6c6f 636b 5f61 7474 7269 6275 7465 733a 5a63 626c 6f63 6b5f
2440460 6174 7472 6962 7574 6573 3b4e 4f62 6a65 6374 3b5f 5f63 745f 5f31 3662 6c6f 636b 5f61 7474 7269 6275 7465 7346 5063 205f
2440540 5f63 745f 5f31 3662 6c6f 636b 5f61 7474 7269 6275 7465 7346 7620 5f5f 6374 5f5f 3136 626c 6f63 6b5f 6174 7472 6962 7574
2440620 6573 4652 4331 3662 6c6f 636b 5f61 7474 7269 6275 7465 7320 5f5f 6474 5f5f 3136 626c 6f63 6b5f 6174 7472 6962 7574 6573
2440700 4676 2073 6574 5f61 7474 7269 6275 7465 5f6e 616d 655f 5f31 3662 6c6f 636b 5f61 7474 7269 6275 7465 7346 5063 205c 0073
2440760 6574 5f61 7474 7269 6275 7465 5f76 616c 7565 5f5f 3136 626c 6f63 6b5f 6174 7472 6962 7574 6573 4650 6320 7365 745f 6174
2441040 7472 6962 7574 655f 7661 6c75 655f 5f31 3662 6c6f 636b 5f61 7474 7269 6275 7465 7346 6920 7365 745f 6174 7472 6962 7574
2441120 655f 7661 6c75 655f 5f31 3662 6c6f 636b 5f61 7474 7269 6275 7465 7346 6620 7365 745f 6174 7472 6962 7574 655f 7479 7065
2441200 5f5f 3136 626c 6f63 6b5f 6174 7472 6962 7574 6573 4650 6320 6765 745f 6174 7472 6962 7574 655f 6e61 6d65 5f5f 3136 626c
2441260 6f63 6b5f 6174 7472 6962 7574 6573 4676 205c 0067 6574 5f61 7474 7269 6275 7465 5f74 7970 655f 5f31 3662 6c6f 636b 5f61
2441340 7474 7269 6275 7465 7346 7620 6765 745f 6174 7472 6962 7574 655f 7376 616c 7565 5f5f 3136 626c 6f63 6b5f 6174 7472 6962
2441420 7574 6573 4676 2067 6574 5f61 7474 7269 6275 7465 5f69 7661 6c75 655f 5f31 3662 6c6f 636b 5f61 7474 7269 6275 7465 7346
2441500 7620 6765 745f 6174 7472 6962 7574 655f 6676 616c 7565 5f5f 3136 626c 6f63 6b5f 6174 7472 6962 7574 6573 4676 2067 6574
2441560 5f61 7474 7269 6275 7465 5f76 616c 7565 5f5f 3136 626c 6f63 6b5f 6174 7472 6962 7574 6573 4676 205c 0065 7870 6c61 696e
2441640 5f5f 3136 626c 6f63 6b5f 6174 7472 6962 7574 6573 4650 6320 3b3b 3b00 5f5f 7074 626c 5f5f 3136 626c 6f63 6b5f 6174 7472
2441720 6962 7574 6573 5f5f 626c 6f63 6b5f 6378 783a 4728 302c 3333 2900 656e 7469 7479 3a54 2830 2c39 3929 3d73 3630 5f5f 7670
2442000 7472 5f5f 364f 626a 6563 743a 2830 2c33 3329 2c30 2c33 323b 6e61 6d65 5f5f 374e 4f62 6a65 6374 3a28 302c 3230 292c 3332
2442060 2c33 323b 6e61 6d65 5f5f 3665 6e74 6974 793a 2830 2c32 3029 2c36 342c 3332 3b46 696c 654e 616d 655f 5f36 656e 7469 7479
2442140 3a28 302c 3230 292c 3936 2c33 323b 6172 6369 6e61 6d65 5f5f 3665 6e74 6974 793a 2830 2c32 3029 2c31 3238 2c33 323b 7479
2442220 7065 5f5f 3665 6e74 6974 793a 2830 2c31 292c 3136 302c 3332 3b61 7263 685f 6c69 6e65 5f5f 3665 6e74 6974 793a 2830 2c31
2442300 292c 3139 322c 3332 3b63 616c 6c5f 6c69 6e65 5f5f 3665 6e74 6974 793a 2830 2c31 292c 3232 342c 3332 3b5c 0070 7263 735f
2442360 6c69 6e65 5f5f 3665 6e74 6974 793a 2830 2c31 292c 3235 362c 3332 3b71 7561 6c69 6669 6564 5f5f 3665 6e74 6974 793a 2830
2442440 2c38 3129 2c32 3838 2c39 363b 7375 625f 626c 6f63 6b73 5f5f 3665 6e74 6974 793a 2830 2c38 3129 2c33 3834 2c39 363b 3b00
2442520 656e 7469 7479 3a5a 6365 6e74 6974 793b 4e4f 626a 6563 743b 5f5f 6374 5f5f 3665 6e74 6974 7946 7620 5f5f 6374 5f5f 3665
```

```
2442600  6e74 6974 7946 5243 3665 6e74 6974 7920 5f5f 6474 5f5f 3665 6e74 6974 7946 7620 7365 745f 656e 7469 7479 5f6e 616d 655f
2442660  5f36 656e 7469 7479 4650 6320 7365 745f 656e 7469 7479 5f66 696c 655f 5f36 656e 7469 7479 4650 6320 7365 745f 656e 7469
2442740  7479 5f61 7263 686e 616d 655f 5f36 656e 7469 7479 4650 6320 7365 745f 656e 7469 7479 5f74 7970 655f 5f36 656e 7469 7479
2443020  4650 6320 5c00 7365 745f 6172 6368 5f6c 696e 655f 5f36 656e 7469 7479 4669 2073 6574 5f63 616c 6c5f 6c69 6e65 5f5f 3665
2443100  6e74 6974 7946 6920 7365 745f 7072 6373 5f6c 696e 655f 5f36 656e 7469 7479 4669 2067 6574 5f65 6e74 6974 795f 6e61 6d65
2443160  5f5f 3665 6e74 6974 7946 7620 6765 745f 656e 7469 7479 5f61 7263 686e 616d 655f 5f36 656e 7469 7479 4676 2067 6574 5f65
2443240  6e74 6974 795f 6669 6c65 5f5f 3665 6e74 6974 7946 7620 6765 745f 656e 7469 7479 5f74 7970 655f 5f36 656e 7469 7479 4676
2443320  205c 0067 6574 5f61 7263 685f 6c69 6e65 5f5f 3665 6e74 6974 7946 7620 6765 745f 6361 6c6c 5f6c 696e 655f 5f36 656e 7469
2443400  7479 4676 2067 6574 5f70 7263 735f 6c69 6e65 5f5f 3665 6e74 6974 7946 7620 6973 4754 455f 5f36 656e 7469 7479 4650 364f
2443460  626a 6563 7420 6973 4c54 455f 5f36 656e 7469 7479 4650 364f 626a 6563 7420 6578 706c 6169 6e5f 5f36 656e 7469 7479 4650
2443540  6320 3b3b 3b00 5f5f 7074 626c 5f5f 3665 6e74 6974 795f 5f62 6c6f 636b 5f63 7878 3a47 2830 2c33 3329 0062 6c6f 636b 3a54
2443620  2830 2c31 3030 293d 7331 3434 5f5f 7670 7472 5f5f 364f 626a 6563 743a 2830 2c33 3329 2c30 2c33 323b 6e61 6d65 5f5f 374e
2443700  4f62 6a65 6374 3a28 302c 3230 292c 3332 2c33 323b 6e61 6d65 5f5f 3562 6c6f 636b 3a28 302c 3230 292c 3634 2c33 323b 7479
2443760  7065 5f5f 3562 6c6f 636b 3a28 302c 3129 2c39 362c 3332 3b4d 475f 4e61 6d65 5f5f 3562 6c6f 636b 3a28 302c 3230 292c 3132
2444040  382c 3332 3b41 475f 5479 7065 5f5f 3562 6c6f 636b 3a28 302c 3230 292c 3136 302c 3332 3b4d 475f 5375 6254 7970 655f 5f35
2444120  626c 6f63 6b3a 2830 2c32 3029 2c31 3932 2c33 323b 5061 7265 6e74 5f5f 3562 6c6f 636b 3a28 302c 3939 292c 3232 342c 3438
2444200  303b 5c00 4d47 4473 6372 7074 6e5f 5f35 626c 6f63 6b3a 2830 2c31 3031 293d 2a28 302c 3932 292c 3730 342c 3332 3b41 6374
2444260  7561 6c5f 5f35 626c 6f63 6b3a 2830 2c38 3129 2c37 3336 2c39 363b 466f 726d 616c 5f5f 3562 6c6f 636b 3a28 302c 3831 292c
2444340  3833 322c 3936 3b52 6573 6f6c 7665 645f 5f35 626c 6f63 6b3a 2830 2c38 3129 2c39 3238 2c39 363b 4174 7472 6962 7574 6573
2444420  5f5f 3562 6c6f 636b 3a28 302c 3331 292c 3130 3234 2c39 363b 4572 7253 7461 7475 735f 5f35 626c 6f63 6b3a 2830 2c31 292c
2444500  3131 3230 2c33 323b 3b00 626c 6f63 6b3a 5a63 626c 6f63 6b3b 4e4f 626a 6563 743b 5f5f 6374 5f5f 3562 6c6f 636b 4676 205f
2444560  5f63 745f 5f35 626c 6f63 6b46 5243 3562 6c6f 636b 205f 5f64 745f 5f35 626c 6f63 6b46 7620 7365 745f 626c 6f63 6b5f 6e61
2444640  6465 5f5f 3562 6c6f 636b 4650 6320 7365 745f 626c 6f63 6b5f 7479 7065 5f5f 3562 6c6f 636b 4650 6320 6765 745f 626c 6f63
2444720  6b5f 6e61 6d65 5f5f 3562 6c6f 636b 4676 2067 6574 5f62 6c6f 636b 5f74 7970 655f 5f35 626c 6f63 6b46 7620 6765 745f 626c
2445000  6f63 6b5f 7061 7265 6e74 5f5f 3562 6c6f 636b 4676 205c 0067 6574 5f62 6c6f 636b 5f4d 6f64 4765 6e5f 5f35 626c 6f63 6b46
2445060  7620 6765 745f 466f 726d 616c 5f5f 3562 6c6f 636b 4676 2067 6574 5f41 6374 7561 6c5f 5f35 626c 6f63 6b46 7620 6765 745f
2445140  5265 736f 6c76 6564 5f5f 3562 6c6f 636b 4676 2067 6574 5f41 7474 7269 6275 7465 5f5f 3562 6c6f 636b 4676 2073 6574 4572
2445220  726f 725f 5f35 626c 6f63 6b46 6320 6765 7445 7272 6f72 5f5f 3562 6c6f 636b 4676 2067 6574 5f63 6f6d 705f 6c65 6e67 7468
2445300  5f5f 3562 6c6f 636b 4676 2069 7351 7561 6c69 6669 6564 5f5f 3562 6c6f 636b 4676 205c 0069 734c 5445 5f5f 3562 6c6f 636b
2445360  4650 364f 626a 6563 7420 6973 4754 455f 5f35 626c 6f63 6b46 5036 4f62 6a65 6374 2065 7870 6c61 696e 5f5f 3562 6c6f 636b
2445440  4650 6320 5265 7665 7273 6541 6c6c 4c69 7374 735f 5f35 626c 6f63 6b46 7620 4368 6563 6b50 6172 614c 6973 7473 5f5f 3562
2445520  6c6f 636b 4676 2043 6865 636b 5061 7261 6d4c 6973 745f 5f35 626c 6f63 6b46 5035 504c 6973 7420 6765 745f 5648 444c 5f43
2445600  6f6d 704c 6162 6c65 5f5f 3562 6c6f 636b 4650 6320 6765 745f 5648 444c 5f43 6f6d 704e 616d 655f 5f35 626c 6f63 6b46 5063
2445660  205c 0057 5f4d 475f 436f 6d70 4473 6372 7074 6e5f 5f35 626c 6f63 6b46 7620 575f 4d47 5f43 6865 636b 436f 6d70 5f5f 3562
2445740  6c6f 636b 4676 2057 5f56 4844 4c5f 436f 6d70 496e 7374 5f5f 3562 6c6f 636b 4676 2057 5f56 4844 4c5f 436f 6d70 4465 635f
2446020  5f35 626c 6f63 6b46 7620 575f 434c 5f41 7263 6842 6f64 795f 5f35 626c 6f63 6b46 7620 575f 434c 5f45 6e74 6974 7944 6563
2446100  5f5f 3562 6c6f 636b 4676 203b 3b3b 005f 5f70 7462 6c5f 5f35 626c 6f63 6b5f 5f62 6c6f 636b 5f63 7878 3a47 2830 2c33 3329
2446160  005f 5f63 745f 5f36 656e 7469 7479 4676 3a66 2830 2c31 3032 293d 2a28 302c 3939 2900 5f5f 3074 6869 733a 7028 302c 3130
2446240  3229 002e 2f68 7878 2f65 6e74 6974 792e 6878 7800 5f5f 3074 6869 733a 7228 302c 3130 3229 005f 5f30 7468 6973 203a 5a74
2446320  6c00 5f5f 6374 5f5f 3665 6e74 6974 7946 7620 3a5a 7446 0049 4f4d 3a47 2830 2c31 3033 293d 2a28 302c 3933 2900 5465 6d70
2446400  3a47 2830 2c32 3029 0062 6c6f 636b 2e63 7878 0073 6574 5f62 6c6f 636b 5f74 7970 655f 5f35 626c 6f63 6b46 5063 3a46 2830
2446460  2c32 2900 5f5f 3074 6869 733a 7028 302c 3130 3429 3d2a 2830 2c31 3030 2900 5f5f 3073 3a70 2830 2c32 3029 005f 5f30 7468
2446540  6973 3a72 2830 2c31 3034 2900 5f5f 3074 6869 7320 3a5a 746c 005f 5f30 7320 3a5a 746c 0073 6574 5f62 6c6f 636b 5f74 7970
2446620  655f 5f35 626c 6f63 6b46 5063 203a 5a74 4600 6578 706c 6169 6e5f 5f35 626c 6f63 6b46 5063 3a46 2830 2c32 2900 5f5f 3074
2446700  6869 733a 7028 302c 3130 3429 005f 5f30 733a 7028 302c 3230 2900 5f5f 3074 6869 733a 7228 302c 3130 3429 005f 5f30 7468
2446760  6973 203a 5a74 6c00 5f5f 3073 203a 5a74 6c00 6578 706c 6169 6e5f 5f35 626c 6f63 6b46 5063 203a 5a74 4600 7365 7445 7272
2447040  6f72 5f5f 3562 6c6f 636b 4663 3a46 2830 2c32 2900 5f5f 3074 6869 733a 7028 302c 3130 3429 005f 5f30 453a 7028 302c 3229
2447120  005f 5f30 7468 6973 3a72 2830 2c31 3034 2900 5f5f 3074 6869 7320 3a5a 746c 005f 5f30 4520 3a5a 746c 0073 6574 4572 726f
2447200  725f 5f35 626c 6f63 6b46 6320 3a5a 7446 0069 7347 5445 5f5f 3562 6c6f 636b 4650 364f 626a 6563 743a 4628 302c 3129 005f
2447260  5f30 7468 6973 3a70 2830 2c31 3034 2900 5f5f 3061 3a70 2830 2c31 3035 293d 2a28 302c 3732 2900 5f5f 3074 6869 733a 7228
2447340  302c 3130 3429 005f 5f30 7468 6973 203a 5a74 6c00 5f5f 3061 203a 5a74 6c00 6973 4754 455f 5f35 626c 6f63 6b46 5036 4f62
2447420  6a65 6374 203a 5a74 4600 6973 4c54 455f 5f35 626c 6f63 6b46 5036 4f62 6a65 6374 3a46 2830 2c31 2900 5f5f 3074 6869 733a
2447500  7028 302c 3130 3429 005f 5f30 613a 7028 302c 3130 3529 005f 5f30 7468 6973 3a72 2830 2c31 3034 2900 5f5f 3074 6869 7320
2447560  3a5a 746c 005f 5f30 6120 3a5a 746c 0069 734c 5445 5f5f 3562 6c6f 636b 4650 364f 626a 6563 7420 3a5a 7446 0069 7351 7561
2447640  6c69 6669 6564 5f5f 3562 6c6f 636b 4676 3a46 2830 2c31 2900 5f5f 3074 6869 733a 7028 302c 3130 3429 005f 5f30 7468 6973
```

| | | | | | | | | | | | | | | | | | | | | | | | | |
|---|---|---|---|---|---|---|---|---|---|---|---|---|---|---|---|---|---|---|---|---|---|---|---|---|
| 2447720 | 3a72 | 2830 | 2c31 | 3034 | 2900 | 5f5f | 3141 | 5452 | 3a28 | 302c | 3130 | 3629 | 3d2a | 2830 | 2c39 | 3829 | 005f | 5f30 | 7468 | 6973 | 203a | 5a74 | 6c00 | 5f5f |
| 2450000 | 3141 | 5452 | 203a | 5a74 | 6c00 | 6973 | 5175 | 616c | 6966 | 6965 | 645f | 5f35 | 626c | 6f63 | 6b46 | 7620 | 3a5a | 7446 | 0057 | 5f56 | 4844 | 4c5f | 436f | 6d70 |
| 2450060 | 4465 | 635f | 5f35 | 626c | 6f63 | 6b46 | 763a | 4628 | 302c | 3229 | 005f | 5f30 | 7468 | 6973 | 3a70 | 2830 | 2c31 | 3034 | 2900 | 5f5f | 3074 | 6869 | 733a | 7228 |
| 2450140 | 302c | 3130 | 3429 | 005f | 5f31 | 4c50 | 463a | 2830 | 2c39 | 3729 | 005f | 5f31 | 4c46 | 3a28 | 302c | 3737 | 2900 | 5f5f | 314c | 6946 | 3a28 | 302c | 3832 | 2900 |
| 2450220 | 5f5f | 305f | 5f58 | 7468 | 6973 | 3030 | 6173 | 7730 | 6e68 | 3a28 | 302c | 3130 | 3329 | 005f | 5f30 | 5f5f | 5873 | 3030 | 6173 | 7730 | 6e68 | 3a28 | 302c | 3230 |
| 2450300 | 2900 | 5f5f | 3074 | 6969 | 7320 | 3a5a | 746c | 005f | 5f31 | 4c50 | 4620 | 3a5a | 746c | 005f | 5f31 | 4c46 | 203a | 5a74 | 6c00 | 5f5f | 314c | 6946 | 203a | 5a74 |
| 2450360 | 6c00 | 5f5f | 305f | 5f58 | 7468 | 6973 | 3030 | 6173 | 7730 | 6e68 | 203a | 5a74 | 6c00 | 5f5f | 305f | 5f58 | 7330 | 3061 | 7377 | 306e | 6820 | 3a5a | 746c | 0057 |
| 2450440 | 5f56 | 4844 | 4c5f | 436f | 6d70 | 4465 | 635f | 5f35 | 626c | 6f63 | 6b46 | 7620 | 3a5a | 7446 | 0057 | 5f56 | 4844 | 4c5f | 436f | 6d70 | 496e | 7374 | 5f5f | 3562 |
| 2450520 | 6c6f | 636b | 4676 | 3a46 | 2830 | 2c32 | 2900 | 5f5f | 3074 | 6869 | 733a | 7028 | 302c | 3130 | 3429 | 005f | 5f30 | 7468 | 6973 | 3a72 | 2830 | 2c31 | 3034 | 2900 |
| 2450600 | 5f5f | 314c | 5046 | 3a28 | 302c | 3937 | 2900 | 5f5f | 314c | 463a | 2830 | 2c37 | 3729 | 005f | 5f31 | 4c69 | 463a | 2830 | 2c38 | 3229 | 005f | 5f30 | 5f5f | 5874 |
| 2450660 | 6869 | 7330 | 3061 | 7377 | 306e | 683a | 2830 | 2c31 | 3033 | 2900 | 5f5f | 305f | 5f58 | 7330 | 3061 | 7377 | 306e | 683a | 2830 | 2c32 | 3029 | 005f | 5f30 | 7468 |
| 2450740 | 6973 | 203a | 5a74 | 6c00 | 5f5f | 314c | 5046 | 203a | 5a74 | 6c00 | 5f5f | 314c | 4620 | 3a5a | 746c | 005f | 5f31 | 4c69 | 4620 | 3a5a | 746c | 005f | 5f30 | 5f5f |
| 2451020 | 5874 | 6869 | 7330 | 3061 | 7377 | 306e | 6820 | 3a5a | 746c | 005f | 5f30 | 5f5f | 5873 | 3030 | 6173 | 7730 | 6e68 | 203a | 5a74 | 6c00 | 575f | 5648 | 444c | 5f43 |
| 2451100 | 6f6d | 7049 | 6e73 | 745f | 5f35 | 626c | 6f63 | 6b46 | 7620 | 3a5a | 7446 | 0067 | 6574 | 5f56 | 4844 | 4c5f | 436f | 6d70 | 4e61 | 6165 | 5f5f | 3562 | 6c6f | 636b |
| 2451160 | 4650 | 633a | 4628 | 302c | 3230 | 2900 | 5f5f | 3074 | 6869 | 733a | 7028 | 302c | 3130 | 3429 | 005f | 5f30 | 6275 | 6666 | 3a70 | 2830 | 2c32 | 3029 | 005f | 5f30 |
| 2451240 | 7468 | 6973 | 3a72 | 2830 | 2c31 | 3034 | 2900 | 5f5f | 3074 | 6969 | 7320 | 3a5a | 746c | 005f | 5f30 | 6275 | 6666 | 203a | 5a74 | 6c00 | 6765 | 745f | 5648 | 444c |
| 2451320 | 5f43 | 6f6d | 704e | 616d | 655f | 5f35 | 626c | 6f63 | 6b46 | 5063 | 203a | 5a74 | 4600 | 6765 | 745f | 5648 | 444c | 5f43 | 6f6d | 704c | 6162 | 6c65 | 5f5f | 3562 |
| 2451400 | 6c6f | 636b | 4650 | 633a | 4628 | 302c | 3230 | 2900 | 5f5f | 3074 | 6869 | 733a | 7028 | 302c | 3130 | 3429 | 005f | 5f30 | 6275 | 6666 | 3a70 | 2830 | 2c32 | 3029 |
| 2451460 | 005f | 5f30 | 7468 | 6973 | 203a | 5a74 | 6c00 | 5f5f | 3062 | 7566 | 6620 | 3a5a | 746c | 0067 | 6574 | 5f56 | 4844 | 4c5f | 436f | 6d70 | 4c61 | 626c | 655f | 5f35 |
| 2451540 | 626c | 6f63 | 6b46 | 5063 | 203a | 5a74 | 4600 | 4368 | 6563 | 6b50 | 6172 | 614c | 6973 | 7473 | 5f5f | 3562 | 6c6f | 636b | 4676 | 3a46 | 2830 | 2c32 | 2900 | 5f5f |
| 2451620 | 3074 | 6869 | 733a | 7028 | 302c | 3130 | 3429 | 005f | 5f30 | 7468 | 6973 | 3a72 | 2830 | 2c31 | 3034 | 2900 | 5f5f | 3074 | 6869 | 7320 | 3a5a | 746c | 0043 | 6865 |
| 2451700 | 636b | 5061 | 7261 | 4c69 | 7374 | 735f | 5f35 | 626c | 6f63 | 6b46 | 7620 | 3a5a | 7446 | 0043 | 6865 | 636b | 5061 | 7261 | 6d4c | 6973 | 745f | 5f35 | 626c | 6f63 |
| 2451760 | 6b46 | 5035 | 504c | 6973 | 743a | 4628 | 302c | 3229 | 005f | 5f30 | 7468 | 6973 | 3a70 | 2830 | 2c31 | 3034 | 2900 | 5f5f | 3061 | 6e79 | 5f6c | 6973 | 743a | 7028 |
| 2452040 | 302c | 3130 | 3729 | 3d2a | 2830 | 2c38 | 3129 | 005f | 5f30 | 7468 | 6973 | 3a72 | 2830 | 2c31 | 3034 | 2900 | 5f5f | 314c | 3a28 | 302c | 3737 | 2900 | 5f5f | 3150 |
| 2452120 | 3a28 | 302c | 3937 | 2900 | 5f5f | 314c | 493a | 2830 | 2c38 | 3229 | 005f | 5f30 | 7468 | 6973 | 203a | 5a74 | 6c00 | 5f5f | 3061 | 6e79 | 5f6c | 6973 | 7420 | 3a5a |
| 2452200 | 746c | 005f | 5f31 | 4c20 | 3a5a | 746c | 005f | 5f31 | 5020 | 3a5a | 746c | 005f | 5f31 | 4c49 | 203a | 5a74 | 6c00 | 4368 | 6563 | 6b50 | 6172 | 616d | 4c69 | 7374 |
| 2452260 | 5f5f | 3562 | 6c6f | 636b | 4650 | 3550 | 4c69 | 7374 | 203a | 5a74 | 4600 | 6765 | 745f | 636f | 6d70 | 5f6c | 656e | 6774 | 685f | 5f35 | 626c | 6f63 | 6b46 | 763a |
| 2452340 | 4628 | 302c | 3129 | 005f | 5f30 | 7468 | 6973 | 3a70 | 2830 | 2c31 | 3034 | 2900 | 5f5f | 3074 | 6869 | 733a | 7228 | 302c | 3130 | 3429 | 005f | 5f31 | 4154 | 523a |
| 2452420 | 2830 | 2c31 | 3036 | 2900 | 5f5f | 3150 | 696e | 5074 | 723a | 2830 | 2c39 | 3729 | 005f | 5f31 | 5069 | 6e4e | 616d | 653a | 2830 | 2c32 | 3029 | 005f | 5f30 | 7468 |
| 2452500 | 6973 | 203a | 5a74 | 6c00 | 5f5f | 3141 | 5452 | 203a | 5a74 | 6c00 | 5f5f | 3150 | 696e | 5074 | 7220 | 3a5a | 746c | 005f | 5f31 | 5069 | 6e4e | 616d | 6520 | 3a5a |
| 2452560 | 746c | 0067 | 6574 | 5f63 | 6f6d | 705f | 6c65 | 6e67 | 7468 | 5f5f | 3562 | 6c6f | 636b | 4676 | 203a | 5a74 | 4600 | 575f | 4d47 | 5f43 | 6865 | 636b | 436f | 6d70 |
| 2452640 | 5f5f | 3562 | 6c6f | 636b | 4676 | 3a46 | 2830 | 2c31 | 2900 | 5f5f | 3074 | 6869 | 733a | 7028 | 302c | 3130 | 3429 | 005f | 5f30 | 7468 | 6973 | 3a72 | 2830 | 2c31 |
| 2452720 | 3034 | 2900 | 5f5f | 305f | 5f58 | 7468 | 6973 | 3030 | 7164 | 3532 | 6564 | 3a28 | 302c | 3130 | 3229 | 005f | 5f30 | 7468 | 6973 | 203a | 5a74 | 6c00 | 5f5f | 305f |
| 2453000 | 5f58 | 7468 | 6973 | 3030 | 7164 | 3532 | 6564 | 203a | 5a74 | 6c00 | 575f | 4d47 | 5f43 | 6865 | 636b | 436f | 6d70 | 5f5f | 3562 | 6c6f | 636b | 4676 | 203a | 5a74 |
| 2453060 | 4600 | 575f | 4d47 | 5f43 | 6f6d | 7044 | 7363 | 7270 | 746e | 5f5f | 3562 | 6c6f | 636b | 4676 | 3a46 | 2830 | 2c32 | 2900 | 5f5f | 3074 | 6869 | 733a | 7028 | 302c |
| 2453140 | 3130 | 3429 | 005f | 5f30 | 7468 | 6973 | 3a72 | 2830 | 2c31 | 3034 | 2900 | 5f5f | 305f | 5f58 | 7468 | 6973 | 3030 | 7175 | 7730 | 6564 | 3a28 | 302c | 3130 | 3329 |
| 2453220 | 005f | 5f30 | 5f5f | 5873 | 3030 | 7175 | 7730 | 6564 | 3a28 | 302c | 3230 | 2900 | 5f5f | 305f | 5f58 | 7468 | 6973 | 3030 | 6132 | 3432 | 6564 | 3a28 | 302c | 3130 |
| 2453300 | 3229 | 005f | 5f30 | 7468 | 6973 | 203a | 5a74 | 6c00 | 5f5f | 305f | 5f58 | 7468 | 6973 | 3030 | 7175 | 7730 | 6564 | 203a | 5a74 | 6c00 | 5f5f | 305f | 5f58 | 7330 |
| 2453360 | 3071 | 7577 | 3065 | 6420 | 3a5a | 746c | 005f | 5f30 | 5f5f | 5874 | 6869 | 7330 | 3061 | 3234 | 3265 | 6420 | 3a5a | 746c | 0057 | 5f4d | 475f | 436f | 6d70 | 4473 |
| 2453440 | 6372 | 7074 | 6e5f | 5f35 | 626c | 6f63 | 6b46 | 7620 | 3a5a | 7446 | 0057 | 5f43 | 4c5f | 456e | 7469 | 7479 | 4465 | 635f | 5f35 | 626c | 6f63 | 6b46 | 763a | 4628 |
| 2453520 | 302c | 3229 | 005f | 5f30 | 7468 | 6973 | 3a70 | 2830 | 2c31 | 3034 | 2900 | 5f5f | 3074 | 6869 | 733a | 7228 | 302c | 3130 | 3429 | 005f | 5f31 | 4c50 | 463a | 2830 |
| 2453600 | 2c39 | 3729 | 005f | 5f31 | 4c46 | 3a28 | 302c | 3737 | 2900 | 5f5f | 314c | 6946 | 3a28 | 302c | 3832 | 2900 | 5f5f | 305f | 5f58 | 7468 | 6973 | 3030 | 6178 | 7730 |
| 2453660 | 6a6a | 3a28 | 302c | 3130 | 3329 | 005f | 5f30 | 5f5f | 5873 | 3030 | 6178 | 7730 | 6a6a | 3a28 | 302c | 3230 | 2900 | 5f5f | 3074 | 6869 | 7320 | 3a5a | 746c | 005f |
| 2453740 | 5f31 | 4c50 | 4620 | 3a5a | 746c | 005f | 5f31 | 4c46 | 203a | 5a74 | 6c00 | 5f5f | 314c | 6946 | 203a | 5a74 | 6c00 | 5f5f | 305f | 5f58 | 7468 | 6973 | 3030 | 6178 |
| 2454020 | 7730 | 6a6a | 203a | 5a74 | 6c00 | 5f5f | 305f | 5f58 | 7330 | 3061 | 7877 | 306a | 6a20 | 3a5a | 746c | 0057 | 5f43 | 4c5f | 456e | 7469 | 7479 | 4465 | 635f | 5f35 |
| 2454100 | 626c | 6f63 | 6b46 | 7620 | 3a5a | 7446 | 0057 | 5f43 | 4c5f | 4172 | 6368 | 426f | 6479 | 5f5f | 3562 | 6c6f | 636b | 4676 | 3a46 | 2830 | 2c32 | 2900 | 5f5f | 3074 |
| 2454160 | 6869 | 733a | 7028 | 302c | 3130 | 3429 | 005f | 5f30 | 7468 | 6973 | 3a72 | 2830 | 2c31 | 3034 | 2900 | 5f5f | 314c | 5046 | 3a28 | 302c | 3937 | 2900 | 5f5f | 314c |
| 2454240 | 463a | 2830 | 2c37 | 3729 | 005f | 5f31 | 4c69 | 463a | 2830 | 2c38 | 3229 | 005f | 5f30 | 5f5f | 5874 | 6869 | 7330 | 3061 | 7877 | 306a | 6a3a | 2830 | 2c31 | 3033 |
| 2454320 | 2900 | 5f5f | 305f | 5f58 | 7330 | 3061 | 7877 | 306a | 6a3a | 2830 | 2c32 | 3029 | 005f | 5f30 | 7468 | 6973 | 203a | 5a74 | 6c00 | 5f5f | 314c | 5046 | 203a | 5a74 |
| 2454400 | 6c00 | 5f5f | 314c | 4620 | 3a5a | 746c | 005f | 5f31 | 4c69 | 4620 | 3a5a | 746c | 005f | 5f30 | 5f5f | 5874 | 6869 | 7330 | 3061 | 7877 | 306a | 6a20 | 3a5a | 746c |
| 2454460 | 005f | 5f30 | 5f5f | 5873 | 3030 | 6178 | 7730 | 6a6a | 203a | 5a74 | 6c00 | 575f | 434c | 5f41 | 7263 | 6842 | 6f64 | 795f | 5f35 | 626c | 6f63 | 6b46 | 7620 | 3a5a |
| 2454540 | 7446 | 005f | 5f73 | 7469 | 5f5f | 626c | 6f63 | 6b5f | 6378 | 785f | 5465 | 6d70 | 5f3a | 4629 | 302c | 3229 | 002f | 7573 | 722f | 4343 | 2f73 | 756e | 342f | 696e |
| 2454620 | 636c | 2f69 | 6f73 | 7472 | 6561 | 6d2e | 6800 | 626c | 6f63 | 6b2e | 6378 | 7800 | 5f5f | 7374 | 645f | 5f62 | 6c6f | 636b | 5f63 | 7878 | 5f54 | 656d | 705f | 3a46 |
| 2454700 | 2830 | 2c32 | 2900 | 2f75 | 7372 | 2f43 | 432f | 7375 | 6e34 | 2f69 | 6e63 | 6c2f | 696f | 7374 | 7265 | 616d | 2e68 | 005f | 5f76 | 7462 | 6c5f | 5f35 | 626c | 6f63 |
| 2454760 | 6b3a | 4728 | 302c | 3130 | 3829 | 3d61 | 7228 | 302c | 3129 | 3b30 | 3b31 | 303b | 2830 | 2c31 | 3529 | 005f | 5f76 | 7462 | 6c5f | 5f31 | 3662 | 6c6f | 636b | 5f61 |

```
2455040 7474 7269 6275 7465 735f 5f62 6c6f 636b 5f63 7878 3a47 2830 2c31 3038 2900 5f5f 7674 626c 5f5f 384c 504f 626a 6563 745f
2455120 5f62 6c6f 636b 5f63 7878 3a47 2930 2c31 3039 2931 6172 2830 2c31 293b 303b 333b 2830 2c31 3529 0065 7870 6c61 696e 5f5f
2455200 3136 626c 6f63 6b5f 6174 7472 6962 7574 6573 4550 633a 6628 302c 3229 005f 5f30 7468 6973 3a70 2830 2c31 3036 2900 5f5f
2455260 3073 3a70 2830 2c32 3029 002e 2f68 7878 2f61 7474 7269 6275 7465 2e68 7878 005f 5f30 7468 6973 3a72 2830 2c31 3036 2900
2455340 5f5f 3074 6869 7320 3a5a 746c 005f 5f30 7320 3a5a 746c 0065 7870 6c61 696e 5f5f 3136 626c 6f63 6b5f 6174 7472 6962 7574
2455420 6573 4650 6320 3a5a 7446 0073 6574 5f70 6172 616d 6574 6572 5f76 616c 7565 5f74 7970 655f 5f39 7061 7261 6d65 7465 7246
2455500 5063 3a66 2830 2c32 2900 5f5f 3074 6869 733a 7028 302c 3937 2900 5f5f 3073 3a70 2830 2c32 3029 002e 2f68 7878 2f70 6172
2455560 616d 6574 6572 2e68 7878 005f 5f30 7468 6973 3a72 2830 2c39 3729 005f 5f30 7468 6973 203a 5a74 6c00 5f5f 3073 203a 5a74
2455640 6c00 7365 745f 7061 7261 6d65 7465 725f 7661 6c75 655f 7479 7065 5f5f 3970 6172 616d 6574 6572 4650 6320 3a5a 7446 0065
2455720 7870 6c61 696e 5f5f 384c 504f 626a 6563 7446 5063 3a66 2830 2c32 2900 5f5f 3074 6869 733a 7028 302c 3131 3029 3d2a 2830
2456000 2c37 3829 005f 5f30 733a 7028 302c 3230 2900 2f68 6f6d 652f 6f73 6173 312f 612f 6162 2f73 7263 2f6e 6577 6f62 6a65 6374
2456060 732f 6878 782f 4c50 4f62 6a65 6374 5f64 622e 6878 7800 5f5f 3074 6869 733a 7228 302c 3131 3029 005f 5f30 7468 6973 203a
2456140 5a74 6c00 5f5f 3073 203a 5a74 6c00 6578 706c 6169 6e5f 5f38 4c50 4f62 6a65 6374 4650 6329 3a5a 7446 0069 734c 5445 5f5f
2456220 374e 4f62 6a65 6374 4650 364f 626a 6563 743a 6628 302c 3129 005f 5f30 7468 6973 3a70 2830 2c37 3929 005f 5f30 5f5f 4133
2456300 393a 7028 302c 3130 3529 002f 686f 6d65 2f6f 7361 7331 2f61 2f61 622f 7372 632f 6e65 776f 626a 6563 7473 2f68 7878 2f4e
2456360 4f62 6a65 6374 5f64 622e 6878 7900 5f5f 3074 6969 7320 3a5a 746c 005f 5f30 5f5f 4133 3920 3a5a 746c 0069 734c 5445 5f5f
2456440 374e 4f62 6a65 6374 4650 364f 626a 6563 7420 3a5a 7446 0069 7347 5445 5f5f 374e 4f62 6a65 6374 4650 364f 626a 6563 743a
2456520 6628 302c 3129 005f 5f30 7468 6973 3a70 2830 2c37 3929 005f 5f30 5f5f 4133 383a 7028 302c 3130 3529 005f 5f30 7468 6973
2456600 203a 5a74 6c00 5f5f 305f 5f41 3338 203a 5a74 6c00 6973 4754 455f 5f37 4e4f 626a 6563 7446 5036 4f62 6a65 6374 203a 5a74
2456660 4600 7365 7450 726f 705f 5f37 4e4f 626a 6563 7446 5063 663a 6628 302c 3229 005f 5f30 7468 6973 3a70 2830 2c37 3929 005f
2456740 5f31 5f5f 4133 363a 7028 302c 3230 2900 5f5f 315f 5f41 3337 3a70 2830 2c31 3029 005f 5f30 7468 6973 203a 5a74 6c00 5f5f
2457020 315f 5f41 3336 203a 5a74 6c00 5f5f 315f 5f41 3337 203a 5a74 6c00 7365 7450 726f 705f 5f37 4e4f 626a 6563 7446 5063 6620
2457100 3a5a 7446 0073 6574 5072 6f70 5f5f 374e 4f62 6a65 6374 4650 6369 3a66 2830 2c32 2900 5f5f 3074 6869 733a 7028 302c 3739
2457160 2900 5f5f 315f 5f41 3334 3a70 2830 2c32 3029 005f 5f31 5f5f 4133 353a 7028 302c 3129 005f 5f30 7468 6973 203a 5a74 6c00
2457240 5f5f 315f 5f41 3334 203a 5a74 6c00 5f5f 315f 5f41 3335 203a 5a74 6c00 7365 7450 726f 705f 5f37 4e4f 626a 6563 7446 5063
2457320 6920 3a5a 7446 0073 6574 5072 6f70 5f5f 374e 4f62 6a65 6374 4650 6354 313a 6628 302c 3229 005f 5f30 7468 6973 3a70 2830
2457400 2c37 3929 005f 5f31 5f5f 4133 323a 7028 302c 3230 2900 5f5f 315f 5f41 3333 3a70 2830 2c32 3029 005f 5f30 7469 6973 203a
2457460 5a74 6c00 5f5f 315f 5f41 3332 203a 5a74 6c00 5f5f 315f 5f41 3333 203a 5a74 6c00 7365 7450 726f 705f 5f37 4e4f 626a 6563
2457540 7446 5063 5431 203a 5a74 4600 6765 7450 726f 705f 5f37 4e4f 626a 6563 7446 5063 693a 6628 302c 3230 2900 5f5f 3074 6869
2457620 733a 7028 302c 3739 2900 5f5f 305f 5f41 3330 3a70 2830 2c32 3029 005f 5f30 5f5f 4133 313a 7028 302c 3129 005f 5f30 7468
2457700 6973 203a 5a74 6c00 5f5f 305f 5f41 3330 203a 5a74 6c00 5f5f 305f 5f41 3331 203a 5a74 6c00 6765 7450 726f 705f 5f37 4e4f
2457760 626a 6563 7446 5063 6920 3a5a 7446 0067 6574 4174 7472 5f5f 374e 4f62 6a65 6374 4669 3a66 2830 2c32 3029 005f 5f30 7468
2460040 6973 3a70 2830 2c37 3929 005f 5f30 5f5f 4132 393a 7028 302c 3129 005f 5f30 7468 6973 203a 5a74 6c00 5f5f 305f 5f41 3239
2460120 203a 5a74 6c00 6765 7441 7474 725f 5f37 4e4f 626a 6563 7446 6920 3a5a 7446 0069 6e4f 7264 6572 5f5f 364f 626a 6563 7446
2460200 5036 4f62 6a65 6374 3a66 2830 2c31 2900 5f5f 3074 6869 733a 7028 302c 3130 3529 005f 5f30 5f5f 4132 373a 7028 302c 3130
2460260 3529 002f 686f 6d65 2f6f 7361 7331 2f61 2f61 622f 7372 632f 6e65 776f 626a 6563 7473 2f68 7878 2f4f 626a 6563 745f 6462
2460340 2e68 7878 005f 5f30 7468 6973 203a 5a74 6c00 5f5f 305f 5f41 3237 203a 5a74 6c00 696e 4f72 6465 725f 5f36 4f62 6a65 6374
2460420 4650 364f 626a 6563 7420 3a5a 7446 0044 6573 556e 6974 2e6f 005f 7365 7450 726f 705f 5f37 4e4f 626a 6563 7446 5063 6600
2460500 5f73 6574 5072 6f70 5f5f 374e 4f62 6a65 6374 4650 6369 005f 6765 7441 7474 725f 5f37 4e4f 626a 6563 7446 6900 5f70 7574
2460560 5f5f 376f 7374 7265 616d 4663 005f 7365 7450 726f 705f 5f37 4e4f 626a 6563 7446 5063 5431 005f 6578 706c 6169 6e5f 5f31
2460640 3044 6573 6967 6e55 6e69 7446 5063 005f 696f 7374 7265 616d 5f69 6e69 7400 5f65 7870 6c61 696e 5f5f 384c 504f 626a 6563
2460720 7446 5063 005f 6765 7450 726f 705f 5f37 4e4f 626a 6563 7446 5063 6900 5f5f 5f63 745f 5f36 656e 7469 7479 4676 005f 696e
2461000 4f72 6465 725f 5f36 4f62 6a65 6374 4650 364f 626a 6563 7400 2f68 6f6d 652f 6f73 6173 312f 612f 6162 2f73 7263 2f6e 6577
2461060 6f62 6a65 6374 732f 7072 6f67 2f43 2b2b 2e32 3332 3633 2f00 4465 7355 6e69 742e 6300 4465 7355 6e69 742e 6378 7800 696e
2461140 743a 7428 302c 3129 3472 2830 2c31 293b 2d32 3134 3734 3833 3634 383b 3231 3437 3438 3336 3437 3b00 6368 6172 3a74 2830
2461220 2c32 293d 7228 302c 3229 3b30 3b31 3237 3b00 6c6f 6e67 3a74 2830 2c33 293d 7228 302c 3129 3b2d 3231 3437 3438 3336 3438
2461300 3b32 3134 3734 3833 3634 373b 0073 686f 7274 3a74 2830 2c34 293d 7228 302c 3129 3b2d 3332 3736 393b 3332 3736 373b 0075
2461360 6e73 6967 6e65 6420 6368 6172 3a74 2830 2c35 293d 7228 302c 3129 3b30 3b32 3535 3b00 756e 7369 676e 6564 2073 686f 7274
2461440 3a74 2830 2c36 293d 7228 302c 3129 3b30 3b36 3535 3335 3b00 756e 7369 676e 6564 206c 6f6e 673a 7428 302c 3729 3d72 2830
2461520 2c31 293b 303b 2d31 3b00 756e 7369 676e 6564 2069 6e74 3a74 2830 2c38 293d 7228 302c 3129 3b30 3b2d 313b 0066 6c6f 6174
2461600 3a74 2830 2c39 293d 7228 302c 3129 3b34 3b30 3b00 646f 7562 6c65 3a74 2830 2c31 3029 3d72 2830 2c31 293b 383b 303b 0076
2461660 6f69 643a 7428 302c 3131 293d 2830 2c31 3129 003f 3f3f 3a74 2830 2c31 3229 3d28 302c 3129 005f 5f76 7074 703a 7428 302c
2461740 3133 293d 2a28 302c 3134 293d 6628 302c 3129 005f 5f6d 7074 723a 5428 302c 3135 293d 7338 643a 2830 2c34 292c 302c 3136
2462020 3b69 3a28 302c 3429 2c31 362c 3136 3b66 3a28 302c 3133 292c 3332 2c33 323b 3b00 5f50 4656 5f3a 7428 302c 3136 293d 2a28
2462100 302c 3137 293d 6628 302c 3229 005f 5046 495f 3a74 2830 2c31 3329 0073 7472 6561 6d70 6f73 3a74 2830 2c31 2900 7374 7265
```

```
2462160 616d 6f66 663a 7428 302c 3129 0069 6f5f 7374 6174 653a 5428 302c 3138 293d 6567 6f6f 6462 6974 5f5f 696f 5f73 7461 7465
2462240 3a30 2c65 6f66 6269 745f 5f69 6f5f 7374 6174 653a 312c 6661 696c 6269 745f 5f69 6f5f 7374 6174 653a 322c 6261 6462 6974
2462320 5f5f 696f 5f73 7461 7465 3a33 2c68 6172 6466 6169 6c5f 5f69 6f5f 7374 6174 653a 342c 3b00 6f70 656e 5f6d 6f64 653a 5428
2462400 302c 3139 293d 6569 6e5f 5f6f 7065 6e5f 6d6f 6465 3a30 2c6f 7574 5f5f 6f70 656e 5f6d 6f64 653a 312c 6174 655f 5f6f 7065
2462460 6e5f 6d6f 6465 3a32 2c61 7070 5f5f 6f70 656e 5f6d 6f64 653a 332c 7472 756e 635f 5f6f 7065 6e5f 6d6f 6465 3a34 2c6e 6f63
2462540 7265 6174 655f 5f6f 7065 6e5f 6d6f 6465 3a35 2c6e 6f72 6570 6c61 6365 5f5f 6f70 656e 5f6d 6f64 653a 362c 3b00 7365 656b
2462620 5f64 6972 3a54 2330 2c32 3029 3d65 6265 675f 5f73 6565 6b5f 6469 723a 302c 6375 725f 5f73 6565 6b5f 6469 723a 312c 656e
2462700 645f 5f73 6565 6b5f 6469 723a 322c 3b00 5f5f 4531 3a54 2830 2c32 3129 3d65 736b 6970 7773 5f5f 5f5f 4531 3a30 2c6c 6566
2462760 745f 5f5f 5f45 313a 312c 7269 6768 745f 5f5f 5f45 313a 322c 696e 7465 726e 616c 5f5f 5f5f 4531 3a33 2c64 6563 5f5f 5f5f
2463040 4531 3a34 2c6f 6374 5f5f 5f5f 4531 3a35 2c68 6578 5f5f 5f5f 4531 3a36 2c73 686f 7762 6173 655f 5f5f 5f45 313a 372c 5c00
2463120 7368 6f77 706f 696e 745f 5f5f 5f45 313a 382c 7570 7065 7263 6173 655f 5f5f 5f45 313a 392c 7368 6f77 706f 735f 5f5f 5f45
2463200 313a 3130 2c73 6369 656e 7469 6669 635f 5f5f 5f45 313a 3131 2c66 6978 6564 5f5f 5f5f 4531 3a31 322c 756e 6974 6275 665f
2463260 5f5f 5f45 313a 3133 2c73 7464 696f 5f5f 5f5f 4531 3a31 342c 3b00 5f5f 4532 3a54 2830 2c32 3229 3d65 736b 6970 7069 6e67
2463340 5f5f 5f5f 4532 3a30 2c74 6965 645f 5f5f 5f45 323a 312c 3b00 696f 733a 5428 302c 3233 293d 7336 306e 7573 6572 5f5f 3369
2463420 6f73 3a28 302c 3129 2c30 2c33 323b 785f 7573 6572 5f5f 3369 6f73 3a28 302c 3237 293d 2a28 302c 3234 293d 7875 696f 735f
2463500 7573 6572 5f75 6e69 616e 3a2c 3332 2c33 323b 6270 5f5f 3369 6f73 3a28 302c 3238 293d 2a28 302c 3235 293d 7973 7374 7265
2463560 616d 6275 663a 2c36 342c 3332 3b73 7461 7465 5f5f 3369 6f73 3a28 302c 3129 2c39 362c 3332 3b69 7370 6563 6961 6c5f 5f33
2463640 696f 733a 2830 2c31 292c 3132 382c 3332 3b6f 7370 6563 6961 6c5f 5f33 696f 733a 2830 2c31 292c 3136 302c 3332 3b69 7366
2463720 785f 7370 6563 6961 6c5f 5f33 696f 733a 2830 2c31 292c 3139 322c 3332 3b6f 7366 785f 7370 6563 6961 6c5f 5f33 696f 733a
2464000 2830 2c31 292c 3232 342c 3332 3b5c 0064 656c 6275 665f 5f33 696f 733a 2830 2c31 292c 3235 362c 3332 3b78 5f74 6965 5f5f
2464060 3369 6f73 3a28 302c 3239 293d 2a28 302c 3236 293d 7873 6f73 7472 6561 6d3a 2c32 3838 2c33 323b 785f 666c 6167 735f 5f33
2464140 696f 733a 2830 2c31 292c 3332 302c 3332 3b78 5f70 7265 6369 7369 6f6e 5f5f 3369 6f73 3a28 302c 3429 2c33 3532 2c31 363b
2464220 785f 6669 6c6c 5f5f 3369 6f73 3a28 302c 3229 2c33 3638 2c38 3b78 5f77 6964 7468 5f5f 3369 6f73 3a28 302c 3429 2c33 3834
2464300 2c31 363b 6173 7369 676e 5f70 7269 7661 7465 5f5f 3369 6f73 3a28 302c 3129 2c34 3136 2c33 323b 5f5f 7670 7472 5f5f 3369
2464360 6f73 3a28 302c 3330 293d 2a28 302c 3135 292c 3434 382c 3332 3b3b 0062 6173 6566 6965 6c64 5f5f 3369 6f73 3a47 2830 2c31
2464440 2900 6164 6a75 7374 6669 656c 645f 5f33 696f 733a 4728 302c 3129 0066 6c6f 6174 6669 656c 645f 5f33 696f 733a 4728 302c
2464520 3129 006e 6578 7462 6974 5f5f 3369 6f73 3a47 2830 2c31 2900 6e65 7874 776f 7264 5f5f 3369 6f73 3a47 2830 2c31 2900 7374
2464600 6469 6f66 6c75 7368 5f5f 3369 6f73 3a47 2830 2c31 3629 0069 6f73 3a5a 6369 6f73 3b3b 5f5f 6374 5f5f 3369 6f73 4650 3973
2464660 7472 6561 6d62 7566 205f 5f63 745f 5f33 696f 7346 7620 5f5f 6374 5f5f 3369 6f73 4652 3369 6f73 205f 5f64 745f 5f33 696f
2464740 7346 7620 666c 6167 735f 5f33 696f 7346 7620 666c 6167 735f 5f33 696f 7346 6c20 7365 7466 5f5f 3369 6f73 466c 5431 2073
2465020 6574 665f 5f33 696f 7346 6c20 756e 7365 7466 5f5f 3369 6f73 466c 2077 6964 7468 5f5f 3369 6f73 4676 2077 6964 7468 5f5f
2465100 3369 6f73 4669 2074 6965 5f5f 3369 6f73 4650 376f 7374 7265 616d 205c 0074 6965 5f5f 3369 6f73 4676 2066 696c 6c5f 5f33
2465160 696f 7346 6320 6669 6c6c 5f5f 3369 6f73 4676 2070 7265 6369 7369 6f6e 5f5f 3369 6f73 4669 2070 7265 6369 7369 6f6e 5f5f
2465240 3369 6f73 4676 2072 6473 7461 7465 5f5f 3369 6f73 4676 205f 5f6f 7050 765f 5f33 696f 7346 7620 5f5f 6e74 5f5f 3369 6f73
2465320 4676 2065 6f66 5f5f 3369 6f73 4676 2066 6169 6c5f 5f33 696f 7346 7620 6261 645f 5f33 696f 7346 7620 676f 6f64 5f5f 3369
2465400 6f73 4676 2063 6c65 6172 5f5f 3369 6f73 4669 2072 6462 7566 5f5f 3369 6f73 4676 205c 0069 776f 7264 5f5f 3369 6f73 4669
2465460 2070 776f 7264 5f5f 3369 6f73 4669 2062 6974 616c 6c6f 635f 5f33 696f 7353 4676 2078 616c 6c6f 635f 5f33 696f 7353 4676
2465540 2075 7265 7369 7a65 5f5f 3369 6f73 4669 2073 796e 635f 7769 7468 5f73 7464 696f 5f5f 3369 6f73 5346 7620 7365 7473 7461
2465620 7465 5f5f 3369 6f73 4669 2069 6e69 745f 5f33 696f 7346 5039 7374 7265 616d 6275 6620 5f5f 6173 5f5f 3369 6f73 4652 3369
2465700 6f73 2073 6b69 705f 5f33 696f 7346 6920 3b62 6173 6566 6965 6c64 5f5f 3369 6f73 205c 0061 646a 7573 7466 6965 6c64 5f5f
2465760 3369 6f73 2066 6c6f 6174 6669 656c 645f 5f33 696f 7320 6e65 7874 6269 745f 5f33 696f 7320 6e65 7874 776f 7264 5f5f 3369
2466040 6f73 2073 7464 696f 666c 7573 685f 5f33 696f 7320 3b3b 0073 7472 6561 6d62 7566 3a54 2830 2c32 3529 3d73 3430 616c 6c6f
2466120 635f 5f39 7374 7265 616d 6275 663a 2830 2c34 292c 302c 3136 3b78 5f75 6e62 7566 5f5f 3973 7472 6561 6d62 7566 3a28 302c
2466200 3429 2c31 362c 3136 3b78 5f62 6173 655f 5f39 7374 7265 616d 6275 663a 2830 2c33 3129 3d2a 2830 2c32 292c 3332 2c33 323b
2466260 785f 7062 6173 655f 5f39 7374 7265 616d 6275 663a 2830 2c33 3129 2c36 342c 3332 3b78 5f70 7074 725f 5f39 7374 7265 616d
2466340 6275 663a 2830 2c33 3129 2c39 362c 3332 3b78 5f65 7070 7472 5f5f 3973 7472 6561 6d62 7566 3a28 302c 3331 292c 3132 382c
2466420 3332 3b78 5f67 7074 725f 5f39 7374 7265 6161 6275 663a 2830 2c33 3129 2c31 3630 2c33 323b 785f 6567 7074 725f 5f39 7374
2466500 7265 616d 6275 663a 2830 2c33 3129 2c31 3932 2c33 323b 5c00 785f 6562 6163 6b5f 5f39 7374 7265 616d 6275 663a 2830 2c33
2466560 3129 2c32 3234 2c33 323b 785f 626c 656e 5f5f 3973 7472 6561 6d62 7566 3a28 302c 3129 2c32 3536 2c33 323b 5f5f 7670 7472
2466640 5f5f 3973 7472 6561 6d62 7566 3a28 302c 3330 292c 3238 382c 3332 3b3b 0073 7472 6561 6d62 7566 3a5a 6373 7472 6561 6d62
2466720 7566 3b3b 5f5f 6374 5f5f 3973 7472 6561 6d62 7566 4652 3973 7472 6561 6d62 7566 205f 5f63 745f 5f39 7374 7265 616d 6275
2467000 6646 7620 5f5f 6374 5f5f 3973 7472 6561 6d62 7566 4650 6369 205f 5f63 745f 5f39 7374 7265 616d 6275 6646 5063 6954 3220
2467060 5f5f 6173 5f5f 3973 7472 6561 6d62 7566 4652 3973 7472 6561 6d62 7566 2064 6270 5f5f 3973 7472 6561 6d62 7566 4676 2062
2467140 6173 655f 5f39 7374 7265 6163 6275 6646 7620 7062 6173 655f 5f39 7374 7265 616d 6275 6646 7620 5c00 7070 7472 5f5f 3973
2467220 7472 6561 6d62 7566 4676 2065 7070 7472 5f5f 3973 7472 6561 6d62 7566 4676 2067 7074 725f 5f39 7374 7265 616d 6275 6646
```

2467300 7620 6567 7074 725f 5f39 7374 7265 616d 6275 6646 7620 6562 6163 6b5f 5f39 7374 7265 616d 6275 6646 7620 6562 7566 5f5f
2467360 3973 7472 6561 6162 7566 4676 2062 6c65 6e5f 5f39 7374 7265 616d 6275 6646 7620 7365 7470 5f5f 3973 7472 6561 6d62 7566
2467440 4650 6354 3120 7365 7467 5f5f 3973 7472 6561 6162 7566 4650 634e 3231 2070 6275 6d70 5f5f 3973 7472 6561 6d62 7566 4669
2467520 205c 0067 6275 6470 5f5f 3973 7472 6561 6d62 7566 4669 2073 6574 625f 5f39 7374 7265 616d 6275 6646 5063 5431 6920 756e
2467600 6275 6666 6572 6564 5f5f 3973 7472 6561 6d62 7566 4676 2075 6e62 7566 6665 7265 645f 5f39 7374 7265 616d 6275 6646 6920
2467660 616c 6c6f 6361 7465 5f5f 3973 7472 6561 6d62 7566 4676 2064 6f61 6c6c 6f63 6174 655f 5f39 7374 7265 616d 6275 6646 7620
2467740 6f76 6572 666c 6f77 5f5f 3973 7472 6561 6d62 7566 4669 2075 6e64 6572 666c 6f77 5f5f 3973 7472 6561 6d62 7566 4676 205c
2470020 0070 6261 636b 6661 696c 5f5f 3973 7472 6561 6d62 7566 4669 2073 796e 635f 5f39 7374 7265 616d 6275 6646 7620 7365 656b
2470100 6f66 665f 5f39 7374 7265 616d 6275 6646 6c39 7365 656b 5f64 6972 6920 7365 656b 706f 735f 5f39 7374 7265 616d 6275 6646
2470160 6c69 2078 7370 7574 6e5f 5f39 7374 7265 616d 6275 6646 5043 6369 2078 7367 6574 6e5f 5f39 7374 7265 616d 6275 6646 5063
2470240 6920 696e 5f61 7661 696c 5f5f 3973 7472 6561 6d62 7566 4676 206f 7574 5f77 6169 7469 6e67 5f5f 3973 7472 6561 6d62 7566
2470320 4676 205c 0073 6765 7463 5f5f 3973 7472 6561 6d62 7566 4676 2073 6e65 7874 635f 5f39 7374 7265 616d 6275 6646 7620 7362
2470400 756d 7063 5f5f 3973 7472 6561 6d62 7566 4676 2073 746f 7373 635f 5f39 7374 7265 616d 6275 6646 7620 7370 7574 6261 636b
2470460 635f 5f39 7374 7265 616d 6275 6646 6320 7370 7574 535f 5f39 7374 7265 616d 6275 6646 6920 7370 7574 6e5f 5f39 7374 7265
2470540 616d 6275 6646 5043 6369 2073 6765 746e 5f5f 3973 7472 6561 6d62 7566 4650 6369 2073 6574 6275 665f 5f39 7374 7265 616d
2470620 6275 6646 5063 6920 5c00 7365 7462 7566 5f5f 3973 7472 6561 6d62 7566 4650 5563 6920 7365 7462 7566 5f5f 3973 7472 6561
2470700 6d62 7566 4650 6369 5432 205f 5f64 745f 5f39 7374 7265 616d 6275 6646 7620 785f 736e 6578 7463 5f5f 3973 7472 6561 6d62
2470760 7566 4676 203b 3b3b 0069 7374 7265 616d 3a54 2830 2c33 3229 3173 3732 785f 6763 6f75 6e74 5f5f 3769 7374 7265 616d 3a28
2471040 302c 3129 2c30 2c33 323b 5f5f 7670 7472 5f5f 3769 7374 7265 616d 3a28 302c 3330 292c 3332 2c33 323b 5069 6f73 3a28 302c
2471120 3333 293d 2a28 302c 3233 292c 3634 2c33 323b 4f69 6f73 3a28 302c 3233 292c 3936 2c34 3830 3b3b 0069 7374 7265 616d 3a5a
2471200 6369 7374 7265 616d 3b69 6f73 3b5f 5f63 745f 5f37 6973 7472 6561 6d46 5039 7374 7265 616d 6275 6620 5f5f 6374 5f5f 3769
2471260 7374 7265 616d 4676 205f 5f63 745f 5f37 6973 7472 6561 6d46 5039 7374 7265 616d 6275 6669 5037 6f73 7472 6561 6d20 5f5f
2471340 6374 5f5f 3769 7374 7265 616d 4669 5063 5431 205f 5f63 745f 5f37 6973 7472 6561 6d46 6954 3150 376f 7374 7265 616d 205f
2471420 5f63 745f 5f37 6973 7472 6561 6d46 5237 6973 7472 6561 6d20 5f5f 6474 5f5f 3769 7374 7265 616d 4676 205c 0069 7066 785f
2471500 5f37 6973 7472 6561 6d46 6920 6973 6678 5f5f 3769 7374 7265 616d 4676 2073 6565 6b67 5f5f 3769 7374 7265 616d 466c 2073
2471560 6565 6b67 5f5f 3769 7374 7265 616d 466c 3873 6565 6b5f 6469 7220 7465 6c6c 675f 5f37 6973 7472 6561 6d46 7620 5f5f 7273
2471640 5f5f 3769 7374 7265 616d 4650 4652 3769 7374 7265 616d 5f52 3769 7374 7265 616d 205f 5f72 735f 5f37 6973 7472 6561 6d46
2471720 5046 5233 696f 735f 5233 696f 7320 5f5f 7273 5f5f 3769 7374 7265 616d 4650 6320 5f5f 7273 5f5f 3769 7374 7265 616d 4650
2472000 5563 205c 005f 5f72 735f 5f37 6973 7472 6561 6d46 5255 6320 5f5f 7273 5f5f 3769 7374 7265 616d 4652 6320 5f5f 7273 5f5f
2472060 3769 7374 7265 616d 4652 7320 5f5f 7273 5f5f 3769 7374 7265 616d 4652 6920 5f5f 7273 5f5f 3769 7374 7265 616d 4652 6c20
2472140 5f5f 7273 5f5f 3769 7374 7265 616d 4652 5573 205f 5f72 735f 5f37 6973 7472 6561 6d46 5255 6920 5f5f 7273 5f5f 3769 7374
2472220 7265 616d 4652 556c 205f 5f72 735f 5f37 6973 7472 6561 6d46 5266 205f 5f72 735f 5f37 6973 7472 6561 6d46 5264 205f 5f72
2472300 735f 5f37 6973 7472 6561 6d46 5039 7374 7265 616d 6275 6620 5c00 6765 745f 5f37 6973 7472 6561 6d46 5063 6963 2067 6574
2472360 5f5f 3769 7374 7265 616d 4650 5563 6963 2067 6574 5f5f 3769 7374 7265 616d 4652 3973 7472 6561 6d62 7566 6320 6765 745f
2472440 5f37 6973 7472 6561 6d46 5255 6320 6765 745f 5f37 6973 7472 6561 6d46 5263 2067 6574 5f5f 3769 7374 7265 616d 4676 2067
2472520 6574 6c69 6e65 5f5f 3769 7374 7265 616d 4650 6369 6320 6765 746c 696e 655f 5f37 6973 7472 6561 6d46 5055 6369 6320 7065
2472600 656b 5f5f 3769 7374 7265 616d 4676 2069 676e 6f72 655f 5f37 6973 7472 6561 6d46 6954 3120 5c00 7265 6164 5f5f 3769 7374
2472660 7265 616d 4650 6369 2072 6561 645f 5f37 6973 7472 6561 6d46 5055 6369 2067 636f 756e 745f 5f37 6973 7472 6561 6d46 7620
2472740 7075 7462 6163 6b5f 5f37 6973 7472 6561 6d46 6320 7379 6e63 5f5f 3769 7374 7265 616d 4676 2064 6f5f 6970 6678 5f5f 3769
2473020 7374 7265 616d 4669 2065 6174 7768 6974 655f 5f37 6973 7472 6561 6d46 7620 7867 6574 5f5f 3769 7374 7265 616d 4650 6320
2473100 3b3b 3b00 6f73 7472 6561 6d3a 5428 302c 3236 293d 7336 385f 5f76 7074 725f 5f37 6f73 7472 6561 6d3a 2830 2c33 3029 2c30
2473160 2c33 323b 5063 6f73 3a28 302c 3333 292c 3332 2c33 323b 4f69 6f73 3a28 302c 3233 292c 3634 2c34 3830 3b3b 006f 7374 7265
2473240 616d 3a5a 636f 7374 7265 616d 3b69 6f73 3b5f 5f63 745f 5f37 6f73 7472 6561 6d46 5039 7374 7265 616d 6275 6620 5f5f 6374
2473320 5f5f 376f 7374 7265 616d 4676 205f 5f63 745f 5f37 6f73 7472 6561 6d46 6920 5f5f 6374 5f5f 376f 7374 7265 616d 4669 5063
2473400 205f 5f63 745f 5f37 6f73 7472 6561 6d46 5237 6f73 7472 6561 6420 5f5f 6474 5f5f 376f 7374 7265 616d 4676 206f 7066 785f
2473460 5f37 6f73 7472 6561 6d46 7620 6f73 6678 5f5f 376f 7374 7265 616d 4676 2066 6c75 7368 5f5f 376f 7374 7265 616d 4676 205c
2473540 0073 6565 6b70 5f5f 376f 7374 7265 616d 466c 2073 6565 6b70 5f5f 376f 7374 7265 616d 466c 3873 6565 6b5f 6469 7220 7465
2473620 6c6c 705f 5f37 6f73 7472 6561 6d46 7620 7075 745f 5f37 6f73 7472 6561 6d46 6320 5f5f 6c73 5f5f 376f 7374 7265 616d 4663
2473700 205f 5f6c 735f 5f37 6f73 7472 6561 6d46 5563 205f 5f6c 735f 5f37 6f73 7472 6561 6d46 5043 6320 5f5f 6c73 5f5f 376f 7374
2473760 7265 616d 4669 205f 5f6c 735f 5f37 6f73 7472 6561 6d46 6c20 5f5f 6c73 5f5f 376f 7374 7265 616d 4664 205f 5f6c 735f 5f37
2474040 6f73 7472 6561 6d46 6620 5c00 5f5f 6c73 5f5f 376f 7374 7265 616d 4655 6920 5f5f 6c73 5f5f 376f 7374 7265 616d 4655 6c20
2474120 5f5f 6c73 5f5f 376f 7374 7265 616d 4650 7620 5f5f 6c73 5f5f 376f 7374 7265 616d 4650 3973 7472 6561 6d62 7566 205f 5f6c
2474200 735f 5f37 6f73 7472 6561 6d46 7320 5f5f 6c73 5f5f 376f 7374 7265 616d 4655 7320 5f5f 6c73 5f5f 376f 7374 7265 616d 4650
2474260 4652 376f 7374 7265 616d 5f52 376f 7374 7265 616d 205f 5f6c 735f 5f37 6f73 7472 6561 6d46 5046 5233 696f 735f 5233 696f
2474340 7320 7772 6974 655f 5f37 6f73 7472 6561 6d46 5043 6369 205c 0077 7269 7465 5f5f 376f 7374 7265 616d 4650 4355 6369 2064

```
2474420 6f5f 6f70 6678 5f5f 376f 7374 7265 616d 4676 2364 6f5f 6f73 6678 5f5f 376f 7374 7265 616d 4676 203b 3b3b 0070 7574 5f5f
2474500 376f 7374 7265 616d 4663 3a66 2830 2c33 3429 3d2a 2830 2c32 3629 005f 5f30 7468 6973 3a70 2830 2c33 3429 005f 5f30 633a
2474560 7028 302c 3229 002f 7573 722f 4343 2f73 756e 342f 696e 636c 2f69 6f73 7472 6561 6d2e 6800 5f5f 3074 6869 733a 7228 302c
2474640 3334 2900 5f5f 3074 6869 7320 3a5a 746c 005f 5f30 6320 3a5a 746c 0070 7574 5f5f 376f 7374 7265 616d 4663 203a 5a74 4600
2474720 696f 7374 7265 616d 3a54 2830 2c33 3529 3d73 3830 785f 6763 6f75 6e74 5f5f 3769 7374 7265 616d 3a28 302c 3129 2c30 2c33
2475000 323b 5f5f 7670 7472 5f5f 3769 7374 7265 616d 3a28 302c 3330 292c 3332 2c33 323b 5069 6f73 3a28 302c 3333 292c 3634 2c33
2475060 323b 4f6f 7374 7265 616d 3a28 302c 3236 292c 3936 2c35 3434 3b3b 0069 6f73 7472 6561 6d3a 5a63 696f 7374 7265 616d 3b69
2475140 7374 7265 616d 206f 7374 7265 616d 2069 6f73 3b5f 5f63 745f 5f38 696f 7374 7265 616d 4650 3973 7472 6561 6d62 7566 205f
2475220 5f63 745f 5f38 696f 7374 7265 616d 4676 205f 5f63 745f 5f38 696f 7374 7265 616d 4652 3869 6f73 7472 6561 6d20 5f5f 6474
2475300 5f5f 3869 6f73 7472 6561 6d46 7620 3b3b 3b00 6369 6e3a 4728 302c 3336 293d 7873 6973 7472 6561 6d5f 7769 7468 6173 7369
2475360 676e 3a00 636f 7574 3a47 2830 2c33 3729 3d78 736f 7374 7265 616d 5f77 6974 6861 7373 6967 6e3a 0063 6572 723a 4728 302c
2475440 3337 2900 636c 6f67 3a47 2830 2c33 3729 0049 6f73 7472 6561 6d5f 696e 6974 3a54 2830 2c33 3829 3173 315f 5f57 395f 5f31
2475520 3349 6f73 7472 6561 6d5f 696e 6974 3a28 302c 3229 2c30 2c38 3b3b 0073 7464 7374 6174 7573 5f5f 3133 496f 7374 7265 616d
2475600 5f69 6e69 743a 4728 302c 3129 0069 6e69 7463 6f75 6e74 5f5f 3133 496f 7374 7265 616d 5f69 6e69 743a 4728 302c 3129 0049
2475660 6f73 7472 6561 6f5f 696e 6974 3a5a 6349 6f73 7472 6561 6d5f 696e 6974 3b3b 5f5f 6374 5f5f 3133 496f 7374 7265 616d 5f69
2475740 6e69 7446 7620 5f5f 6474 5f5f 3133 496f 7374 7265 616d 5f69 6e69 7446 7620 3b73 7464 7374 6174 7573 5f5f 3133 496f 7374
2476020 7265 6161 5f69 6e69 7420 696e 6974 636f 756e 745f 5f31 3349 6f73 7472 6561 6d5f 696e 6974 203b 4069 6f73 3b00 696f 7374
2476100 7265 616d 5f69 6e69 743a 5328 302c 3338 2900 4750 543a 7428 302c 3133 2900 736d 616e 6970 5f69 6e74 3a54 2830 2c33 3929
2476160 3d73 3866 6374 5f5f 3130 736d 616e 6970 5f69 6e74 3a28 302c 3430 293d 2a28 302c 3431 293d 6628 302c 3333 292c 302c 3332
2476240 3b61 7267 5f5f 3130 736d 616e 6970 5f69 6e74 3a28 302c 3129 2c33 322c 3332 3b3b 0073 6d61 6e69 705f 696e 743a 5a63 736d
2476320 616e 6970 5f69 6e74 3b3b 5f5f 6374 5f5f 3130 736d 616e 6970 5f69 6e74 4650 4652 3369 6f73 695f 5233 696f 7369 203b 3b5f
2476400 5f6c 735f 5f46 5237 6f73 7472 6561 6d52 3130 736d 616e 6970 5f69 6e74 205f 5f72 735f 5f46 5237 6973 7472 6561 6d52 3130
2476460 736d 616e 6970 5f69 6e74 203b 0073 6170 706c 795f 696e 743a 5428 302c 3432 293d 7334 6663 745f 5f31 3073 6170 706c 795f
2476540 696e 743a 2830 2c34 3029 2c30 2c33 323b 3b00 7361 7070 6c79 5f69 6e74 3a5a 6373 6170 706c 795f 696e 743b 3b5f 5f63 745f
2476620 5f31 3073 6170 706c 795f 696e 7446 5046 5233 696f 7369 5f52 3369 6f73 205f 5f63 6c5f 5f31 3073 6170 706c 795f 696e 7446
2476700 6920 3b3b 3b00 696d 616e 6970 5f69 6e74 3a54 2830 2c34 3329 3d73 3866 6374 5f5f 3130 696d 616e 6970 5f69 6e74 3a28 302c
2476760 3434 293d 2a28 302c 3435 293d 6628 302c 3436 293d 2a28 302c 3332 292c 302c 3332 3b61 7267 5f5f 3130 696d 616e 6970 5f69
2477040 6e74 3a28 302c 3129 2c33 322c 3332 3b3b 0069 6d61 6e69 705f 696e 743a 5a63 696d 616e 6970 5f69 6e74 3b3b 5f5f 6374 5f5f
2477120 3130 696d 616e 6970 5f69 6e74 4650 4652 3769 7374 7265 616d 695f 5237 6973 7472 6561 6d69 203b 3b5f 5f72 735f 5f46 5237
2477200 6973 7472 6561 6d52 3130 696d 616e 6970 5f69 6e74 203b 0069 6170 706c 795f 696e 743a 5428 302c 3437 293d 7334 6663 745f
2477260 5f31 3069 6170 706c 795f 696e 743a 2830 2c34 3429 2c30 2c33 323b 3b00 6961 7070 6c79 5f69 6e74 3a5a 6369 6170 706c 795f
2477340 696e 743b 3b5f 5f63 745f 5f31 3069 6170 706c 795f 696e 7446 5046 5237 6973 7472 6561 6d69 5f52 3769 7374 7265 616d 205f
2477420 5f63 6c5f 5f31 3069 6170 706c 795f 696e 7446 6920 3b3b 3b00 6f6d 616e 6970 5f69 6e74 3a54 2830 2c34 3829 3d73 3866 6374
2477500 5f5f 3130 6f6d 616e 6970 5f69 6e74 3a28 302c 3439 293d 2a28 302c 3530 293d 6628 302c 3334 292c 302c 3332 3b61 7267 5f5f
2477560 3130 6f6d 616e 6970 5f69 6e74 3a28 302c 3129 2c33 322c 3332 3b3b 006f 6d61 6e69 705f 696e 743a 5a63 6f6d 616e 6970 5f69
2477640 6e74 3b3b 5f5f 6374 5f5f 3130 6f6d 616e 6970 5f69 6e74 4650 4652 376f 7374 7265 616d 695f 5237 6f73 7472 6561 6d69 203b
2477720 3b5f 5f6c 735f 5f46 5237 6f73 7472 6561 6d52 3130 6f6d 616e 6970 5f69 6e74 203b 006f 6170 706c 795f 696e 743a 5428 302c
2500000 3531 293d 7334 6663 745f 5f31 306f 6170 706c 795f 696e 743a 2830 2c34 3929 2c30 2c33 323b 3b00 6f61 7070 6c79 5f69 6e74
2500060 3a5a 636f 6170 706c 795f 696e 743b 3b5f 5f63 745f 5f31 306f 6170 706c 795f 696e 7446 5046 5237 6f73 7472 6561 6d69 5f52
2500140 376f 7374 7265 616d 205f 5f63 6c5f 5f31 306f 6170 706c 795f 696e 7446 6920 3b3b 3b00 696f 6d61 6e69 705f 696e 743a 5428
2500220 302c 3532 293d 7338 6663 745f 5f31 3169 6f6d 616e 6970 5f69 6e74 3a28 302c 3533 293d 2a28 302c 3534 293d 6628 302c 3535
2500300 293d 2a28 302c 3335 292c 302c 3332 3b61 7267 5f5f 3131 696f 6d61 6e69 705f 696e 743a 2830 2c31 292c 3332 2c33 323b 3b00
2500360 696f 6d61 6e69 705f 696e 743a 5a63 696f 6d61 6e69 705f 696e 743b 3b5f 5f63 745f 5f31 3169 6f6d 616e 6970 5f69 6e74 4650
2500440 4652 3869 6f73 7472 6561 6d69 5f52 3869 6f73 7472 6561 6d69 203b 3b5f 5f6c 735f 5f46 5238 696f 7374 7265 616d 5231 3169
2500520 6f6d 616e 6970 5f69 6e74 205f 5f72 735f 5f46 5238 696f 7374 7265 6161 5231 3169 6f6d 616e 6970 5f69 6e74 203b 0069 6f61
2500600 7070 6c79 5f69 6e74 3a54 2830 2c35 3629 3d73 3466 6374 5f5f 3131 696f 6170 706c 795f 696e 743a 2830 2c35 3329 2c30 2c33
2500660 323b 3b00 696f 6170 706c 795f 696e 743a 5a63 696f 6170 706c 795f 696e 743b 3b5f 5f63 745f 5f31 3169 6f61 7070 6c79 5f69
2500740 6e74 4650 4652 3869 6f73 7472 6561 6d69 5f52 3869 6f73 7472 6561 6d20 5f5f 636c 5f5f 3131 696f 6170 706c 795f 696e 7446
2501020 6920 3b3b 3b00 736d 616e 6970 5f6c 6f6e 673a 5428 302c 3537 293d 7338 6663 745f 5f31 3173 6d61 6e69 705f 6c6f 6e67 3a28
2501100 302c 3430 292c 302c 3332 3b61 7267 5f5f 3131 736d 616e 6970 5f6c 6f6e 673a 2830 2c31 292c 3332 2c33 323b 3b00 736d 616e
2501160 6970 5f6c 6f6e 673a 5a63 736d 616e 6970 5f6c 6f6e 673b 3b5f 5f63 745f 5f31 3173 6d61 6e69 705f 6c6f 6e67 4650 4652 3369
2501240 6f73 6c5f 5233 696f 736c 203b 3b5f 5f6c 735f 5f46 5237 6f73 7472 6561 6d52 3131 736d 616e 6970 5f6c 6f6e 6720 5f5f 7273
2501320 5f5f 4652 3769 7374 7265 616d 5231 3173 6d61 6e69 705f 6c6f 6e67 203b 0073 6170 706c 795f 6c6f 6e67 3a54 2830 2c35 3829
2501400 3d73 3466 6374 5f5f 3131 7361 7070 6c79 5f6c 6f6e 673a 2830 2c34 3029 2c30 2c33 323b 3b00 7361 7070 6c79 5f6c 6f6e 673a
2501460 5a63 7361 7070 6c79 5f6c 6f6e 673b 3b5f 5f63 745f 5f31 3173 6170 706c 795f 6c6f 6e67 4650 4652 3369 6f73 6c5f 5233 696f
```

```
2501540  7320 5f5f 636c 5f5f 3131 7361 7070 6c79 5f6c 6f6e 6746 6c20 3b3b 3b00 696d 616e 6970 5f6c 6f6e 673a 5428 302c 3539 293d
2501620  7338 6663 745f 5f31 3169 6d61 6e69 705f 6c6f 6e67 3a28 302c 3434 292c 302c 3332 3b61 7267 5f5f 3131 696d 616e 6970 5f6c
2501700  6f6e 673a 2830 2c31 292c 3332 2c33 323b 3b00 696d 616e 6970 5f6c 6f6e 673a 5a63 696d 616e 6970 5f6c 6f6e 673b 3b5f 5f63
2501760  745f 5f31 3169 6d61 6e69 705f 6c6f 6e67 4650 4652 3769 7374 7265 616d 6c5f 5237 6973 7472 6561 6d6c 203b 3b5f 5f72 735f
2502040  5f46 5237 6973 7472 6561 6d52 3131 696d 616e 6970 5f6c 6f6e 6720 3b00 6961 7070 6c79 5f6c 6f6e 673a 5428 302c 3630 293d
2502120  7334 6663 745f 5f31 3169 6170 706c 795f 6c6f 6e67 3a28 302c 3434 292c 302c 3332 3b3b 0069 6170 706c 795f 6c6f 6e67 3a5a
2502200  6369 6170 706c 795f 6c6f 6e67 3b3b 5f5f 6374 5f5f 3131 6961 7070 6c79 5f6c 6f6e 6746 5046 5237 6973 7472 6561 6d6c 5f52
2502260  3769 7374 7265 616d 205f 5f63 6c5f 5f31 3169 6170 706c 795f 6c6f 6e67 466c 203b 3b3b 006f 6d61 6e69 705f 6c6f 6e67 3a54
2502340  2830 2c36 3129 3173 3866 6374 5f5f 3131 6f6d 616e 6970 5f6c 6f6e 673a 2830 2c34 3929 2c30 2c33 323b 6172 675f 5f31 316f
2502420  6d61 6e69 705f 6c6f 6e67 3a28 302c 3129 2c33 322c 3332 3b3b 006f 6d61 6e69 705f 6c6f 6e67 3a5a 636f 6d61 6e69 705f 6c6f
2502500  6e67 3b3b 5f5f 6374 5f5f 3131 6f6d 616e 6970 5f6c 6f6e 6746 5046 5237 6f73 7472 6561 6d6c 5f52 376f 7374 7265 616d 6c20
2502560  3b3b 5f5f 6c73 5f5f 4652 376f 7374 7265 6161 5231 316f 6d61 6e69 705f 6c6f 6e67 203b 006f 6170 706c 795f 6c6f 6e67 3a54
2502640  2830 2c36 3229 3d73 3466 6374 5f5f 3131 6f61 7070 6c79 5f6c 6f6e 673a 2830 2c34 3929 2c30 2c33 323b 3b00 6f61 7070 6c79
2502720  5f6c 6f6e 673a 5a63 6f61 7070 6c79 5f6c 6f6e 673b 3b5f 5f63 745f 5f31 316f 6170 706c 795f 6c6f 6e67 4650 4652 376f 7374
2503000  7265 616d 6c5f 5237 6f73 7472 6561 6d20 5f5f 636c 5f5f 3131 6f61 7070 6c79 5f6c 6f6e 6746 6c20 3b3b 3b00 696f 6d61 6e69
2503060  705f 6c6f 6e67 3a54 2830 2c36 3329 3d73 3866 6374 5f5f 3132 696f 6d61 6e69 705f 6c6f 6e67 3a28 302c 3533 292c 302c 3332
2503140  3b61 7267 5f5f 3132 696f 6d61 6e69 705f 6c6f 6e67 3a28 302c 3129 2c33 322c 3332 3b3b 0069 6f6d 616e 6970 5f6c 6f6e 673a
2503220  5a63 696f 6d61 6e69 705f 6c6f 6e67 3b3b 5f5f 6374 5f5f 3132 696f 6d61 6e69 705f 6c6f 6e67 4650 4652 3869 6f73 7472 6561
2503300  6d6c 5f52 3869 6f73 7472 6561 6d6c 203b 3b5f 5f6c 735f 5f46 5238 696f 7374 7265 616d 5231 3269 6f6d 616e 6970 5f6c 6f6e
2503360  6720 5f5f 7273 5f5f 4652 3869 6f73 7472 6561 6d52 3132 696f 6d61 6e69 705f 6c6f 6e67 203b 0069 6f61 7070 6c79 5f6c 6f6e
2503440  673a 5428 302c 3634 293d 7334 6663 745f 5f31 3269 6f61 7070 6c79 5f6c 6f6e 673a 2830 2c35 3329 2c30 2c33 323b 3b00 696f
2503520  6170 706c 795f 6c6f 6e67 3a5a 6369 6f61 7070 6c79 5f6c 6f6e 673b 3b5f 5f63 745f 5f31 3269 6f61 7070 6c79 5f6c 6f6e 6746
2503600  5046 5238 696f 7374 7265 616d 6c5f 5238 696f 7374 7265 616d 205f 5f63 6c5f 5f31 3269 6f61 7070 6c79 5f6c 6f6e 6746 6c20
2503660  3b3b 3b00 6572 726e 6f3a 4728 302c 3129 0073 7973 5f6e 6572 723a 4728 302c 3129 0073 7464 696f 6275 663a 5428 302c 3636
2503740  293d 7335 3261 6c6c 6f63 5f5f 3973 7472 6561 6d62 7566 3a28 302c 3429 2c30 2c31 363b 785f 756e 6275 665f 5f39 7374 7265
2504020  616d 6275 663a 2830 2c34 292c 3136 2c31 363b 785f 6261 7365 5f5f 3973 7472 6561 6d62 7566 3a28 302c 3331 292c 3332 2c33
2504100  323b 785f 7062 6173 655f 5f39 7374 7265 616d 6275 663a 2830 2c33 3129 2c36 342c 3332 3b78 5f70 7074 725f 5f39 7374 7265
2504160  616d 6275 663a 2830 2c33 3129 2c39 362c 3332 3b78 5f65 7070 7472 5f5f 3973 7472 6561 6d62 7566 3a28 302c 3331 292c 3132
2504240  382c 3332 3b78 5f67 7074 725f 5f39 7374 7265 616d 6275 663a 2830 2c33 3129 2c31 3630 2c33 323b 785f 6567 7074 725f 5f39
2504320  7374 7265 616d 6275 663a 2830 2c33 3129 2c31 3932 2c33 323b 5c00 785f 6562 6163 6b5f 5f39 7374 7265 616d 6275 663a 2830
2504400  2c33 3129 2c32 3234 2c33 323b 785f 626c 656e 5f5f 3973 7472 6561 6d62 7566 3a28 302c 3129 2c32 3536 2c33 323b 5f5f 7670
2504460  7472 5f5f 3973 7472 6561 6d62 7566 3a28 302c 3330 292c 3238 392c 3332 3b66 705f 5f38 7374 6469 6f62 7566 3a28 302c 3637
2504540  293d 2a28 302c 3635 293d 7873 5f69 6f62 7566 3a2c 3332 302c 3332 3b6c 6173 745f 6f70 5f5f 3873 7464 696f 6275 663a 2830
2504620  2c31 292c 3335 322c 3332 3b62 7566 5f5f 3873 7464 696f 6275 663a 2830 2c36 3829 3d61 7228 302c 3129 3b30 3b31 3b28 302c
2504700  3229 2c33 3834 2c31 363b 3b00 7374 6469 6f62 7566 3a5a 6373 7464 696f 6275 663b 7374 7265 616d 6275 663b 6f76 6572 666c
2504760  6f77 5f5f 3873 7464 696f 6275 6646 6920 756e 6465 7266 6c6f 775f 5f38 7374 6469 6f62 7566 4676 2073 796e 635f 5f38 7374
2505040  6469 6f62 7566 4676 2073 6565 6b6f 6666 5f5f 3873 7464 696f 6275 6646 6c38 7365 656b 5f64 6972 6920 7062 6163 6b66 6169
2505120  6c5f 5f38 7374 6469 6f62 7566 4669 205f 5f63 745f 5f38 7374 6469 6f62 7566 4650 365f 696f 6275 6620 5f5f 6374 5f5f 3873
2505200  7464 696f 6275 6646 5243 3873 7464 696f 6275 6620 5c00 7374 6469 6f66 696c 655f 5f38 7374 6469 6f62 7566 4676 205f 5f64
2505260  745f 5f38 7374 6469 6f62 7566 4676 203b 3b3b 0066 696c 6562 7566 3a54 2830 2c36 3929 3d73 3634 616c 6c6f 635f 5f39 7374
2505340  7265 616d 6275 663a 2830 2c34 292c 302c 3136 3b78 5f75 6e62 7566 5f5f 3973 7472 6561 6d62 7566 3a28 302c 3429 2c31 362c
2505420  3136 3b78 5f62 6173 655f 5f39 7374 7265 616d 6275 663a 2830 2c33 3129 2c33 322c 3332 3b78 5f70 6261 7365 5f5f 3973 7472
2505500  6561 6d62 7566 3a28 302c 3331 292c 3634 2c33 323b 785f 7070 7472 5f5f 3973 7472 6561 6d62 7566 3a28 302c 3331 292c 3936
2505560  2c33 323b 785f 6570 7074 725f 5f39 7374 7265 616d 6275 663a 2830 2c33 3129 2c31 3238 2c33 323b 785f 6770 7472 5f5f 3973
2505640  7472 6561 6d62 7566 3a28 302c 3331 292c 3136 302c 3332 3b78 5f65 6770 7472 5f5f 3973 7472 6561 6d62 7566 3a28 302c 3331
2505720  292c 3139 322c 3332 3b5c 0078 5f65 6261 636b 5f5f 3973 7472 6561 6d62 7566 3a28 302c 3331 292c 3232 342c 3332 3b78 5f62
2506000  6c65 6e5f 5f39 7374 7265 616d 6275 663a 2830 2c31 292c 3235 362c 3332 3b5f 5f76 7074 725f 5f39 7374 7265 616d 6275 663a
2506060  2830 2c33 3029 2c32 3838 2c33 323b 7866 645f 5f37 6669 6c65 6275 663a 2830 2c31 292c 3332 302c 3332 3b6d 6f64 655f 5f37
2506140  6669 6c65 6275 663a 2830 2c31 292c 3335 322c 3332 3b6f 7065 6e65 645f 5f37 6669 6c65 6275 663a 2830 2c32 292c 3338 342c
2506220  383b 6c61 7374 5f73 6565 6b5f 5f37 6669 6c65 6275 663a 2830 2c31 292c 3431 362c 3332 3b69 6e5f 7374 6172 745f 5f37 6669
2506300  6c65 6275 663a 2830 2c33 3129 2c34 3438 2c33 323b 6c61 6865 6164 5f5f 3766 696c 6562 7566 3a28 302c 3638 292c 3438 302c
2506360  3136 3b3b 006f 7065 6e70 726f 745f 5f37 6669 6c65 6275 663a 4728 302c 3129 0066 696c 6562 7566 3a5a 6366 696c 6562 7566
2506440  3b73 7472 6561 6d62 7566 3b5f 5f63 745f 5f37 6669 6c65 6275 6646 7620 5f5f 6374 5f5f 3766 696c 6562 7566 4669 205f 5f63
2506520  745f 5f37 6669 6c65 6275 6646 6950 6354 3120 5f5f 6374 5f5f 3766 696c 6562 7566 4652 4337 6669 6c65 6275 6620 6973 5f6f
2506600  7065 6e5f 5f37 6669 6c65 6275 6646 7620 6664 5f5f 3766 696c 6562 7566 4676 206f 7065 6e5f 5f37 6669 6c65 6275 6646 5043
```

| | | | | | | | | | | | | | | | | | | | | | | | | |
|---|---|---|---|---|---|---|---|---|---|---|---|---|---|---|---|---|---|---|---|---|---|---|---|---|
| 2506660 | 6369 | 5432 | 2061 | 7474 | 6163 | 685f | 5f37 | 6669 | 6c65 | 6275 | 6646 | 6920 | 636c | 6f73 | 655f | 5f37 | 6669 | 6c65 | 6275 | 6646 | 7620 | 5c00 | 5f5f | 6474 |
| 2506740 | 5f5f | 3766 | 696c | 6562 | 7566 | 4676 | 206f | 7665 | 7266 | 6c6f | 775f | 5f37 | 6669 | 6c65 | 6275 | 6646 | 6920 | 756e | 6465 | 7266 | 6c6f | 775f | 5f37 | 6669 |
| 2507020 | 6c65 | 6275 | 6646 | 7620 | 7379 | 6e63 | 5f5f | 3766 | 696c | 6562 | 7566 | 4676 | 2073 | 6565 | 6b6f | 6666 | 5f5f | 3766 | 696c | 6562 | 7566 | 466c | 3873 | 6565 |
| 2507100 | 6b5f | 6469 | 7269 | 2073 | 6574 | 6275 | 665f | 5f37 | 6669 | 6c65 | 6275 | 6646 | 5063 | 6920 | 6c61 | 7374 | 5f6f | 705f | 5f37 | 6669 | 6c65 | 6275 | 6646 | 7620 |
| 2507160 | 3b6f | 7365 | 6e70 | 726f | 745f | 5f37 | 6669 | 6c65 | 6275 | 6620 | 3b3b | 0066 | 7374 | 7265 | 616d | 6261 | 7365 | 3a54 | 2830 | 2c37 | 3029 | 3d73 | 3133 | 3262 |
| 2507240 | 7566 | 5f5f | 3131 | 6673 | 7472 | 6561 | 6d62 | 6173 | 653a | 2830 | 2c36 | 3929 | 2c30 | 2c35 | 3132 | 3b5f | 5f76 | 7074 | 725f | 5f31 | 3166 | 7374 | 7265 | 616d |
| 2507320 | 6261 | 7365 | 3a28 | 302c | 3330 | 292c | 3531 | 322c | 3332 | 3b50 | 696f | 733a | 2830 | 2c33 | 3329 | 2c35 | 3434 | 2c33 | 323b | 4f69 | 6f73 | 3a28 | 302c | 3233 |
| 2507400 | 292c | 3537 | 362c | 3438 | 303b | 3b00 | 6673 | 7472 | 6561 | 6362 | 6173 | 653a | 5a63 | 6673 | 7472 | 6561 | 6d62 | 6173 | 653b | 696f | 733b | 5f5f | 6374 | 5f5f |
| 2507460 | 3131 | 6673 | 7472 | 6561 | 6d62 | 6173 | 6546 | 7620 | 5f5f | 6374 | 5f5f | 3131 | 6673 | 7472 | 6561 | 6d62 | 6173 | 6546 | 5043 | 6369 | 5432 | 205f | 5f63 | 745f |
| 2507540 | 5f31 | 3166 | 7374 | 7265 | 616d | 6261 | 7365 | 4669 | 205f | 5f63 | 745f | 5f31 | 3166 | 7374 | 7265 | 616d | 6261 | 7365 | 4669 | 5063 | 5431 | 205f | 5f63 | 745f |
| 2507620 | 5f31 | 3166 | 7374 | 7265 | 616d | 6261 | 7365 | 4652 | 3131 | 6673 | 7472 | 6561 | 6d62 | 6173 | 6520 | 5f5f | 6474 | 5f5f | 3131 | 6673 | 7472 | 6561 | 6d62 | 6173 |
| 2507700 | 6546 | 7620 | 6f70 | 656e | 5f5f | 3131 | 6673 | 7472 | 6561 | 6d62 | 6173 | 6546 | 5043 | 6369 | 5432 | 205c | 0061 | 7474 | 6163 | 685f | 5f31 | 3166 | 7374 | 7265 |
| 2507760 | 616d | 6261 | 7365 | 4669 | 2063 | 6c6f | 7365 | 5f5f | 3131 | 6673 | 7472 | 6561 | 6d62 | 6173 | 6546 | 7620 | 7365 | 7462 | 7566 | 5f5f | 3131 | 6673 | 7472 | 6561 |
| 2510040 | 6d62 | 6173 | 6546 | 5063 | 6920 | 7264 | 6275 | 665f | 5f31 | 3166 | 7374 | 7265 | 616d | 6261 | 7365 | 4676 | 2076 | 6572 | 6966 | 795f | 5f31 | 3166 | 7374 | 7265 |
| 2510120 | 616d | 6261 | 7365 | 4669 | 203b | 3b3b | 0073 | 7461 | 7465 | 5f76 | 616c | 7565 | 3a74 | 2830 | 2c31 | 3829 | 004f | 626a | 6563 | 743a | 5428 | 302c | 3731 | 293d |
| 2510200 | 7334 | 5f5f | 7670 | 7472 | 5f5f | 364f | 626a | 6563 | 743a | 2830 | 2c33 | 3029 | 2c30 | 2c33 | 323b | 3b00 | 4f62 | 6a65 | 6374 | 3a5a | 634f | 626a | 6563 | 743b |
| 2510260 | 3b5f | 5f63 | 745f | 5f36 | 4f62 | 6a65 | 6374 | 4676 | 205f | 5f63 | 745f | 5f36 | 4f62 | 6a65 | 6374 | 4652 | 4336 | 4f62 | 6a65 | 6374 | 2065 | 7272 | 6f72 | 4d65 |
| 2510340 | 6d6f | 7273 | 5f5f | 364f | 626a | 6563 | 7446 | 5063 | 5431 | 2065 | 7870 | 6c61 | 696e | 5f5f | 364f | 626a | 6563 | 7446 | 5063 | 2069 | 6e4f | 7264 | 6572 | 5f5f |
| 2510420 | 364f | 626a | 6563 | 7446 | 5036 | 4f62 | 6a65 | 6374 | 203b | 3b3b | 005f | 5f70 | 7462 | 6c5f | 5f36 | 4f62 | 6a65 | 6374 | 5f5f | 4465 | 7355 | 6e69 | 745f | 6378 |
| 2510500 | 783a | 4728 | 302c | 3330 | 2900 | 5046 | 3a74 | 2830 | 2c31 | 3529 | 0050 | 4643 | 3a74 | 2830 | 2c31 | 3529 | 0050 | 4649 | 3a74 | 2830 | 2c31 | 3529 | 004e | 4f62 |
| 2510560 | 6a65 | 6374 | 3a54 | 2830 | 2c37 | 3229 | 3d73 | 385f | 5f76 | 7074 | 725f | 5f36 | 4f62 | 6a65 | 6374 | 3a28 | 302c | 3330 | 292c | 302c | 3332 | 3b6e | 616d | 655f |
| 2510640 | 5f37 | 4e4f | 626a | 6563 | 743a | 2830 | 2c33 | 3129 | 2c33 | 322c | 3332 | 3b3b | 004e | 4f62 | 6a65 | 6374 | 3a5a | 634e | 4f62 | 6a65 | 6374 | 3b4f | 626a | 6563 |
| 2510720 | 743b | 5f5f | 6374 | 5f5f | 374e | 4f62 | 6a65 | 6374 | 4650 | 6320 | 5f5f | 6374 | 5f5f | 374e | 4f62 | 6a65 | 6374 | 4652 | 4337 | 4e4f | 626a | 6563 | 7420 | 7365 |
| 2511000 | 744e | 616d | 655f | 5f37 | 4e4f | 626a | 6563 | 7446 | 5063 | 2067 | 6574 | 4e61 | 6d65 | 5f5f | 374e | 4f62 | 6a65 | 6374 | 4676 | 2065 | 7870 | 6c61 | 696e | 5f5f |
| 2511060 | 374e | 4f62 | 6a65 | 6374 | 4650 | 6320 | 6765 | 7441 | 7474 | 725f | 5f37 | 4e4f | 626a | 6563 | 7446 | 6920 | 6765 | 7450 | 726f | 705f | 5f37 | 4e4f | 626a | 6563 |
| 2511140 | 7446 | 5063 | 6920 | 7365 | 7450 | 726f | 705f | 5f37 | 4e4f | 626a | 6563 | 7446 | 5063 | 5431 | 205c | 0073 | 6574 | 5072 | 6f70 | 5f5f | 374e | 4f62 | 6a65 | 6374 |
| 2511220 | 4650 | 6369 | 2073 | 6574 | 5072 | 6f70 | 5f5f | 374e | 4f62 | 6a65 | 6374 | 4650 | 6366 | 2069 | 7347 | 5445 | 5f5f | 374e | 4f62 | 6a65 | 6374 | 4650 | 364f | 626a |
| 2511300 | 6563 | 7420 | 6973 | 4c54 | 455f | 5f37 | 4e4f | 626a | 6563 | 7446 | 5036 | 4f62 | 6a65 | 6374 | 203b | 3b3b | 006f | 7374 | 7265 | 616d | 5f77 | 6974 | 6861 | 7373 |
| 2511360 | 6967 | 6e3a | 5428 | 302c | 3337 | 293d | 7336 | 385f | 5f76 | 7074 | 725f | 5f37 | 6f73 | 7472 | 6561 | 6d3a | 2830 | 2c33 | 3029 | 2c30 | 2c33 | 323b | 5069 | 6f73 |
| 2511440 | 3a28 | 302c | 3333 | 292c | 3332 | 2c33 | 323b | 4f69 | 6f73 | 3a28 | 302c | 3233 | 292c | 3634 | 2c34 | 3830 | 3b3b | 006f | 7374 | 7265 | 616d | 5f77 | 6974 | 6861 |
| 2511520 | 7373 | 6967 | 6e3a | 5a63 | 6f73 | 7472 | 6561 | 6d5f | 7769 | 7468 | 6173 | 7369 | 676e | 3b6f | 7374 | 7265 | 616d | 2069 | 6f73 | 3b5f | 5f63 | 745f | 5f31 | 386f |
| 2511600 | 7374 | 7265 | 616d | 5f77 | 6974 | 6861 | 7373 | 6967 | 6e46 | 7620 | 5f5f | 6374 | 5f5f | 3138 | 6f73 | 7472 | 6561 | 6d5f | 7769 | 7468 | 6173 | 7369 | 676e | 4652 |
| 2511660 | 3138 | 6f73 | 7472 | 6561 | 6d5f | 7769 | 7468 | 6173 | 7369 | 676e | 205f | 5f64 | 745f | 5f31 | 386f | 7374 | 7265 | 616d | 5f77 | 6974 | 6861 | 7373 | 6967 | 6e46 |
| 2511740 | 7620 | 5f5f | 6173 | 5f5f | 3138 | 6f73 | 7472 | 6561 | 6d5f | 7769 | 7468 | 6173 | 7369 | 676e | 4652 | 376f | 7374 | 7265 | 616d | 205c | 005f | 5f61 | 735f | 5f31 |
| 2512020 | 386f | 7374 | 7265 | 616d | 5f77 | 6974 | 6861 | 7373 | 6967 | 6e46 | 5039 | 7374 | 7265 | 6161 | 6275 | 6620 | 3b3b | 3b00 | 5046 | 423a | 7428 | 302c | 3135 | 2900 |
| 2512100 | 4c4e | 4f62 | 6a65 | 6374 | 3a54 | 2830 | 2c37 | 3329 | 3d73 | 3132 | 5f5f | 7670 | 7472 | 5f5f | 364f | 626a | 6563 | 743a | 2830 | 2c33 | 3029 | 2c30 | 2c33 | 323b |
| 2512160 | 6e61 | 6d65 | 5f5f | 374e | 4f62 | 6a65 | 6374 | 3a28 | 302c | 3331 | 292c | 3332 | 2c33 | 323b | 6e65 | 7874 | 5f5f | 384c | 4e4f | 626a | 6563 | 743a | 2830 | 2c37 |
| 2512240 | 3429 | 3d2a | 2830 | 2c37 | 3329 | 2c36 | 342c | 3332 | 3b3b | 004c | 4e4f | 626a | 6563 | 743a | 5a63 | 4c4e | 4f62 | 6a65 | 6374 | 3b4e | 4f62 | 6a65 | 6374 | 3b5f |
| 2512320 | 5f63 | 745f | 5f38 | 4c4e | 4f62 | 6a65 | 6374 | 4650 | 6350 | 384c | 4e4f | 626a | 6563 | 7420 | 5f5f | 6374 | 5f5f | 384c | 4e4f | 626a | 6563 | 7446 | 5243 | 384c |
| 2512400 | 4e4f | 626a | 6563 | 7420 | 7365 | 744e | 6578 | 745f | 5f39 | 4c4e | 4f62 | 6a65 | 6374 | 4650 | 384c | 4e4f | 626a | 6563 | 7420 | 6765 | 744e | 6578 | 745f | 5f38 |
| 2512460 | 4c4e | 4f62 | 6a65 | 6374 | 4676 | 203b | 3b3b | 004c | 4f62 | 6a65 | 6374 | 3a54 | 2830 | 2c37 | 3529 | 3d73 | 385f | 5f76 | 7074 | 725f | 5f36 | 4f62 | 6a65 | 6374 |
| 2512540 | 3a28 | 302c | 3330 | 292c | 302c | 3332 | 3b6e | 6578 | 745f | 5f37 | 4c4f | 626a | 6563 | 743a | 2830 | 2c37 | 3629 | 3d2a | 2830 | 2c37 | 3529 | 2c33 | 322c | 3332 |
| 2512620 | 3b3b | 004c | 4f62 | 6a65 | 6374 | 3a5a | 634c | 4f62 | 6a65 | 6374 | 3b4f | 626a | 6563 | 743b | 5f5f | 6374 | 5f5f | 374c | 4f62 | 6a65 | 6374 | 4650 | 374c | 4f62 |
| 2512700 | 6a65 | 6374 | 205f | 5f63 | 745f | 5f37 | 4c4f | 626a | 6563 | 7446 | 5243 | 374c | 4f62 | 6a65 | 6374 | 2073 | 6574 | 4e65 | 7874 | 5f5f | 374c | 4f62 | 6a65 | 6374 |
| 2512760 | 4650 | 374c | 4f62 | 6a65 | 6374 | 2067 | 6574 | 4e65 | 7874 | 5f5f | 374c | 4f62 | 6a65 | 6374 | 4676 | 203b | 3b3b | 004c | 504f | 626a | 6563 | 743a | 5428 | 302c |
| 2513040 | 3737 | 293d | 7331 | 325f | 5f76 | 7074 | 725f | 5f36 | 4f62 | 6a65 | 6374 | 3a28 | 302c | 3330 | 292c | 302c | 3332 | 3b6e | 6578 | 745f | 5f37 | 4c4f | 626a | 6563 |
| 2513120 | 743a | 2830 | 2c37 | 3629 | 2c33 | 322c | 3332 | 3b6e | 6f62 | 6a70 | 7472 | 5f5f | 384c | 504f | 626a | 6563 | 743a | 2830 | 2c37 | 3829 | 3d2a | 2830 | 2c37 | 3229 |
| 2513200 | 2c36 | 342c | 3332 | 3b3b | 004c | 504f | 626a | 6563 | 743a | 5a63 | 4c50 | 4f62 | 6a65 | 6374 | 3b4c | 4f62 | 6a65 | 6374 | 3b5f | 5f63 | 745f | 5f38 | 4c50 | 4f62 |
| 2513260 | 6a65 | 6374 | 4650 | 374e | 4f62 | 6a65 | 6374 | 5037 | 4c4f | 626a | 6563 | 7420 | 5f5f | 6374 | 5f5f | 384c | 504f | 626a | 6563 | 7446 | 5243 | 384c | 504f | 626a |
| 2513340 | 6563 | 7420 | 7365 | 744f | 626a | 6563 | 745f | 5f38 | 4c50 | 4f62 | 6a65 | 6374 | 4650 | 374e | 4f62 | 6a65 | 6374 | 2067 | 6574 | 4f62 | 6a65 | 6374 | 5f5f | 384c |
| 2513420 | 504f | 626a | 6563 | 7446 | 7620 | 6578 | 706c | 6169 | 6e5f | 5f38 | 4c50 | 4f62 | 6a65 | 6374 | 4650 | 6320 | 3b3b | 3b00 | 5f5f | 7074 | 626c | 5f5f | 384c | 504f |
| 2513500 | 626a | 6563 | 745f | 5f44 | 6573 | 556e | 6974 | 5f63 | 7879 | 3a47 | 2830 | 2c33 | 3029 | 004c | 6973 | 743a | 5428 | 302c | 3739 | 293d | 7331 | 3263 | 6f75 | 6e74 |
| 2513560 | 5f5f | 344c | 6973 | 743a | 2830 | 2c31 | 292c | 302c | 3332 | 3b70 | 7472 | 4c4f | 626a | 6563 | 745f | 5f34 | 4c69 | 7374 | 3a28 | 302c | 3736 | 292c | 3332 | 2c33 |
| 2513640 | 323b | 5f5f | 7670 | 7472 | 5f5f | 344c | 6973 | 743a | 2830 | 2c33 | 3029 | 2c36 | 342c | 3332 | 3b3b | 004c | 6973 | 743a | 5a63 | 4c69 | 7374 | 3b3b | 5f5f | 6374 |
| 2513720 | 5f5f | 344c | 6973 | 7446 | 7620 | 5f5f | 6374 | 5f5f | 344c | 6973 | 7446 | 5243 | 344c | 6973 | 7420 | 5f5f | 6474 | 5f5f | 344c | 6973 | 7446 | 7620 | 6765 | 7443 |

2514000 6f75 6e74 5f5f 344c 6973 7446 7620 6765 7454 6f70 5f5f 344c 6973 7446 7620 7365 7454 6f70 5f5f 344c 6973 7446 5037 4c4f
2514060 626a 6563 7420 6572 726f 724d 656d 6f72 795f 5f34 4c69 7374 4650 6354 3120 6272 6f61 6463 6173 745f 5f34 4c69 7374 464d
2514140 364f 626a 6563 7446 765f 7620 6578 706c 6169 6e5f 5f34 4c69 7374 4650 6320 5c00 696e 7365 7274 5f5f 344c 6973 7446 5037
2514220 4c4f 626a 6563 7420 6973 4d65 6d62 6572 5f5f 344c 6973 7446 5037 4c4f 626a 6563 7420 6973 4d65 6d62 6572 5f5f 344c 6973
2514300 7446 5063 2069 7345 7175 616c 5f5f 344c 6973 7446 5234 4c69 7374 2072 656d 6f76 655f 5f34 4c69 7374 4650 6320 3b3b 3b00
2514360 5f5f 7074 626c 5f5f 344c 6973 745f 5f44 6573 556e 6974 5f63 7478 3a47 2830 2c33 3029 0050 4c69 7374 3a54 2830 2c38 3029
2514440 3473 3132 636f 756e 745f 5f34 4c69 7374 3a28 302c 3129 2c30 2c33 323b 7074 724c 4f62 6a65 6374 5f5f 344c 6973 743a 2830
2514520 2c37 3629 2c33 322c 3332 3b5f 5f76 7074 725f 5f34 4c69 7374 3a28 302c 3330 292c 3634 2c33 323b 3b00 504c 6973 743a 5a63
2514600 504c 6973 743b 4c69 7374 3b69 6e73 6572 745f 5f35 504c 6973 7446 5038 4c50 4f62 6a65 6374 2069 6e73 6572 745f 5f35 504c
2514660 6973 7446 5235 504c 6973 7420 536f 7274 5f50 4c69 7374 5f5f 3550 4c69 7374 4669 2072 6576 6572 7365 5f5f 3550 4c69 7374
2514740 4676 2069 6e73 6572 7441 6674 6572 5f5f 3550 4c69 7374 4650 384c 504f 626a 6563 7454 3120 7265 6d6f 7665 5f5f 3550 4c69
2515020 7374 4650 384c 504f 626a 6563 7420 7265 6d6f 7665 5f5f 3550 4c69 7374 4650 6320 6973 4d65 6d62 6572 5f5f 3550 4c69 7374
2515100 4650 6320 5c00 6973 4d65 6d62 6572 5f5f 3550 4c69 7374 4650 374c 4f62 6a65 6374 2069 7345 7175 616c 5f5f 3550 4c69 7374
2515160 4652 344c 6973 7420 6578 706c 6169 6e5f 5f35 504c 6973 7446 5063 205f 5f63 745f 5f35 504c 6973 7446 5243 3550 4c69 7374
2515240 205f 5f63 745f 5f35 504c 6973 7446 7620 3b3b 3b00 5f5f 7074 626c 5f5f 3550 4c69 7374 5f5f 4465 7355 6e69 745f 6378 783a
2515320 4728 302c 3330 2900 4c69 7374 4974 6572 6174 6f72 3a54 2830 2c38 3129 3d73 386c 6973 745f 5f31 324c 6973 7449 7465 7261
2515400 746f 723a 2830 2c38 3229 3d2a 2830 2c37 3929 2c30 2c33 323b 705f 5f31 324c 6973 7449 7465 7261 746f 723a 2830 2c37 3629
2515460 2c33 322c 3332 3b3b 004c 6973 7449 7465 7261 746f 723a 5a63 4c69 7374 4974 6572 6174 6f72 3b3b 5f5f 6374 5f5f 3132 4c69
2515540 7374 4974 6572 6174 6f72 4652 344c 6973 7420 7265 7365 745f 5f31 324c 6973 7449 7465 7261 746f 7246 7620 6174 7461 6368
2515620 5f5f 3132 4c69 7374 4974 6572 6174 6f72 4652 344c 6973 7420 6765 7443 7572 7265 6e74 5f5f 3132 4c69 7374 4974 6572 6174
2515700 6f72 4676 205f 5f70 705f 5f31 324c 6973 7449 7465 7261 746f 7246 7620 3b3b 3b00 5661 6c75 655f 5479 7065 3a54 2830 2c38
2515760 3329 3d65 554e 4b4e 4f57 4e56 3a30 2c53 5452 494e 473a 312c 494e 5445 4745 523a 322c 464c 4f41 543a 332c 3b00 426c 6f63
2516040 6b5f 5479 7065 3a54 2830 2c38 3429 3d65 554e 4b4e 4f57 4e42 3a30 2c45 4e54 4954 593a 312c 4655 4e43 5449 4f4e 3a32 2c50
2516120 524f 4345 4455 5245 3a33 2c3b 0045 6e74 6974 795f 5479 7065 3a54 2830 2c38 3529 3d65 554e 4b4e 4f57 4e45 3a30 2c41 5243
2516200 4849 5445 4354 5552 453a 312c 5355 4250 524f 4752 414d 3a32 2c3b 0050 696e 5f54 7970 653a 5428 302c 3836 293d 6555 4e4b
2516260 4e4f 574e 503a 302c 494e 5049 4e3a 312c 4f55 5450 494e 3a32 2c49 4e4f 5554 5049 4e3a 332c 3b00 5061 7261 5f43 6c61 7373
2516340 3a54 2830 2c38 3729 3d65 554e 4b4e 4f57 4e43 3a30 2c46 4f52 4441 4c3a 312c 4143 5455 414c 3a32 2c52 4553 4f4c 5645 443a
2516420 332c 3b00 424f 4f4c 4541 4e3a 5428 302c 3838 293d 6546 616c 7365 3a30 2c54 7275 653a 312c 3b00 426f 6f6c 6561 6e3a 5428
2516500 302c 3839 293d 6566 616c 7365 3a30 2c74 7275 653a 312c 3b00 4275 6666 6572 3a47 2830 2c33 3129 0050 696e 4c65 6e67 7468
2516560 3a54 2830 2c39 3029 3d73 3136 5f5f 7670 7472 5f5f 364f 626a 6563 743a 2830 2c33 3029 2c30 2c33 323b 6e61 6d65 5f5f 374e
2516640 4f62 6a65 6374 3a28 302c 3331 292c 3332 2c33 323b 436c 656e 6774 685f 5f39 5069 6e4c 656e 6774 683a 2830 2c33 3129 2c36
2516720 342c 3332 3b49 6c65 6e67 7468 5f5f 3950 696e 4c65 6e67 7468 3a28 302c 3129 2c39 362c 3332 3b3b 0050 696e 4c65 6e67 7468
2517000 3a5a 6350 696e 4c65 6e67 7468 3b4e 4f62 6a65 6374 3b5f 5f63 745f 5f39 5069 6e4c 656e 6774 6846 5063 5431 205f 5f63 745f
2517060 5f39 5069 6e4c 656e 6774 6846 5243 3950 696e 4c65 6e67 7468 2073 6574 5f50 696e 4c65 6e67 7468 5f5f 3950 696e 4c65 6e67
2517140 7468 4650 6354 3120 6765 745f 495f 5069 6e4c 656e 6774 685f 5f39 5069 6e4c 656e 6774 6846 7620 6765 745f 495f 5069 6e4c
2517220 656e 6774 685f 5f39 5069 6e4c 656e 6774 6846 6920 3b3b 3b00 436f 6447 656e 3a54 2830 2c39 3129 3d73 3234 4269 7457 6964
2517300 7468 5f5f 364d 6f64 4765 5e3a 2830 2c31 292c 302c 3332 3b45 5374 6174 655f 5f36 4d6f 6447 656e 3a28 302c 3839 292c 3332
2517360 2c33 323b 5069 6e4e 616d 654c 656e 6774 685f 5f36 4d6f 6447 656e 3a28 302c 3830 292c 3634 2c39 363b 5f5f 7670 7472 5f5f
2517440 364d 6f64 4765 6e3a 2830 2c33 3029 2c31 3630 2c33 323b 3b00 4d6f 6447 656e 3a5a 634d 6f64 4765 6e3b 3b5f 5f63 745f 5f36
2517520 4d6f 6447 656e 4676 205f 5f63 745f 5f36 4d6f 6447 656e 4652 4136 4d6f 6447 656e 2073 6574 5f42 6974 5769 6474 685f 5f36
2517600 4d6f 6447 656e 4669 2073 6574 5f45 5374 6174 655f 5f36 4d6f 6447 656e 4637 426f 6f6c 6561 6e20 6765 745f 4553 7461 7465
2517660 5f5f 364d 6f64 4765 6e46 7620 7365 745f 5069 6e4c 656e 6774 685f 5f36 4d6f 6447 656e 4650 6354 3120 6765 745f 5069 6e4c
2517740 656e 6774 685f 5f36 4d6f 6447 656e 4650 6320 7365 7449 6e64 6578 5f5f 364d 6f64 4765 6e46 7620 5c00 7365 744e 616d 6549
2520020 6e64 6578 5f5f 364d 6f64 4765 6e46 5063 204c 6f61 645f 5648 444c 5f44 6174 615f 5f36 4d6f 6447 656e 4650 374e 4f62 6a65
2520100 6374 2043 6f6d 706f 7365 5f4d 6f64 4765 6e5f 4465 7363 7269 7074 6f72 5f5f 364d 6f64 4765 6e46 5063 2065 7870 6c61 696e
2520160 5f5f 364d 6f64 4765 6e46 7620 5f5f 6474 5f5f 364d 6f64 4765 6e46 7620 3b3b 3b00 5f5f 7074 626c 5f5f 364d 6f64 4765 6e5f
2520240 5f44 6573 556e 6974 5f63 7878 3a47 2830 2c33 3029 0049 4f5f 4d61 6e61 6765 723a 5428 302c 3932 293d 7333 3669 6670 5f5f
2520320 3130 494f 5f4d 616e 6167 6572 3a28 302c 3637 292c 302c 3332 3b6f 6670 5f5f 3130 494f 5f4d 616e 6167 6572 3a28 302c 3637
2520400 292c 3332 2c33 323b 6d66 705f 5f31 3049 4f5f 4d61 6e61 6765 723a 2830 2c36 3729 2c36 342c 3332 3b63 6670 5f5f 3130 494f
2520460 5f4d 616e 6167 6572 3a28 302c 3637 292c 3936 2c33 323b 4946 696c 654e 616d 655f 5f31 3049 4f5f 4d61 6e61 6765 723a 2830
2520540 2c33 3129 2c31 3238 2c33 323b 4f46 696c 654e 616d 655f 5f31 3049 4f5f 4d61 6e61 6765 723a 2830 2c33 3129 2c31 3630 2c33
2520620 323b 4d46 696c 654e 616d 655f 5f31 3049 4f5f 4d61 6e61 6765 723a 2830 2c33 3129 2c31 3932 2c33 323b 4346 696c 654e 616d
2520700 655f 5f31 3049 4f5f 4d61 6e61 6765 723a 2830 2c33 3129 2c32 3234 2c33 323b 6375 4c69 6e65 5f5f 3130 494f 5f4d 616e 6167
2520760 6572 3a28 302c 3129 2c32 3536 2c33 323b 3b00 494f 5f4d 616e 6167 6572 3a5a 6349 4f5f 4d61 6e61 6765 723b 3b5f 5f63 745f
2521040 5f31 3049 4f5f 4d61 6e61 6765 7246 5063 205f 5f64 745f 5f31 3049 4f5f 4d61 6e61 6765 7246 7620 494f 4368 6563 6b5f 5f31

| | | | | | | | | | | | | | | | | | | | | | | | | |
|---|---|---|---|---|---|---|---|---|---|---|---|---|---|---|---|---|---|---|---|---|---|---|---|---|
| 2521120 | 3049 | 4f5f | 4d61 | 6e61 | 6765 | 7246 | 7620 | 436f | 7079 | 4669 | 6c65 | 546f | 4c69 | 6e65 | 5f5f | 3130 | 494f | 5f4d | 616e | 6167 | 6572 | 4669 | 2043 | 6f70 |
| 2521200 | 7946 | 696c | 6554 | 6f45 | 6e64 | 5f5f | 3130 | 494f | 5f4d | 616e | 6167 | 6572 | 4676 | 2053 | 7461 | 746d | 656e | 7448 | 616e | 6465 | 6c65 | 725f | 5f31 | 3049 |
| 2521260 | 4f5f | 4d61 | 6e61 | 6765 | 7246 | 5063 | 5431 | 6920 | 5c00 | 436f | 7079 | 4669 | 6c65 | 546f | 4b65 | 7957 | 5f5f | 3130 | 494f | 5f4d | 616e | 6167 | 6572 | 4650 |
| 2521340 | 6354 | 3120 | 4561 | 745f | 5374 | 6174 | 656d | 656e | 745f | 5f31 | 3049 | 4f5f | 4d61 | 6e61 | 6765 | 7246 | 5063 | 5431 | 2057 | 5f4f | 7574 | 4669 | 6c65 | 5f5f |
| 2521420 | 3130 | 494f | 5f4d | 616e | 6167 | 6572 | 4650 | 6320 | 575f | 4d46 | 696c | 655f | 5f31 | 3049 | 4f5f | 4d61 | 6e61 | 6765 | 7246 | 5063 | 2057 | 5f43 | 4669 | 6c65 |
| 2521500 | 5f5f | 3130 | 494f | 5f4d | 616e | 6167 | 6572 | 4650 | 6320 | 3b3b | 3b00 | 656e | 7469 | 7479 | 3a54 | 2830 | 2c39 | 3329 | 3d73 | 3630 | 5f5f | 7670 | 7472 | 5f5f |
| 2521560 | 364f | 625a | 6563 | 743a | 2830 | 2c33 | 3029 | 2c30 | 2c33 | 323b | 6e61 | 6d65 | 5f5f | 374e | 4f62 | 6a65 | 6374 | 3a28 | 302c | 3331 | 292c | 3332 | 2c33 | 323b |
| 2521640 | 6e61 | 6d65 | 5f5f | 3665 | 6e74 | 6974 | 793a | 2830 | 2c33 | 3129 | 2c36 | 342c | 3332 | 3b46 | 696c | 654e | 616d | 655f | 5f36 | 656e | 7469 | 7479 | 3a28 | 302c |
| 2521720 | 3331 | 292c | 3936 | 2c33 | 323b | 6172 | 6368 | 6e61 | 6d65 | 5f5f | 3665 | 6e74 | 6974 | 793a | 2830 | 2c33 | 3129 | 2c31 | 3238 | 2c33 | 323b | 7479 | 7065 | 5f5f |
| 2522000 | 3665 | 6e74 | 6974 | 793a | 2830 | 2c31 | 292c | 3136 | 302c | 3332 | 3b61 | 7263 | 685f | 6c69 | 6e65 | 5f5f | 3665 | 6e74 | 6974 | 793a | 2830 | 2c31 | 292c | 3139 |
| 2522060 | 322c | 3332 | 3b63 | 616c | 6c5f | 6c69 | 6e65 | 5f5f | 3665 | 6e74 | 6974 | 793a | 2830 | 2c31 | 292c | 3232 | 342c | 3332 | 3b5c | 0070 | 7263 | 735f | 6c69 | 6e65 |
| 2522140 | 5f5f | 3665 | 6e74 | 6974 | 793a | 2830 | 2c31 | 292c | 3235 | 362c | 3332 | 3b71 | 7561 | 6c69 | 6669 | 6564 | 5f5f | 3665 | 6e74 | 6974 | 793a | 2830 | 2c38 | 3029 |
| 2522220 | 2c32 | 3838 | 2c39 | 363b | 7375 | 625f | 626c | 6f63 | 6b73 | 5f5f | 3665 | 6e74 | 6974 | 793a | 2830 | 2c38 | 3029 | 2c33 | 3834 | 2c39 | 363b | 3b00 | 656e | 7469 |
| 2522300 | 7479 | 3a5a | 6365 | 6e74 | 6974 | 793b | 4e4f | 626a | 6563 | 743b | 5f5f | 6374 | 5f5f | 3665 | 6e74 | 6974 | 7946 | 7620 | 5f5f | 6374 | 5f5f | 3665 | 6e74 | 6974 |
| 2522360 | 7946 | 5243 | 3665 | 6e74 | 6974 | 7920 | 5f5f | 6474 | 5f5f | 3665 | 6e74 | 6974 | 7946 | 7620 | 7365 | 745f | 656e | 7469 | 7479 | 5f6e | 616d | 655f | 5f36 | 656e |
| 2522440 | 7469 | 7479 | 4650 | 6320 | 7365 | 745f | 656e | 7469 | 7479 | 5f66 | 696c | 655f | 5f36 | 656e | 7469 | 7479 | 4650 | 6320 | 7365 | 745f | 656e | 7469 | 7479 | 5f61 |
| 2522520 | 7263 | 686e | 616d | 655f | 5f36 | 656e | 7469 | 7479 | 4650 | 6320 | 7365 | 745f | 656e | 7469 | 7479 | 5f74 | 7970 | 655f | 5f36 | 656e | 7469 | 7479 | 4650 | 6320 |
| 2522600 | 5c00 | 7365 | 745f | 6172 | 6368 | 5f6c | 696e | 655f | 5f36 | 656e | 7469 | 7479 | 4669 | 2073 | 6574 | 5f63 | 616c | 6c5f | 6c69 | 6e65 | 5f5f | 3665 | 6e74 | 6974 |
| 2522660 | 7946 | 6920 | 7365 | 745f | 7072 | 6373 | 5f6c | 696e | 655f | 5f36 | 656e | 7469 | 7479 | 4669 | 2067 | 6574 | 5f65 | 6e74 | 6974 | 795f | 6e61 | 6d65 | 5f5f | 3665 |
| 2522740 | 6e74 | 6974 | 7946 | 7620 | 6765 | 745f | 656e | 7469 | 7479 | 5f61 | 7263 | 686e | 616d | 655f | 5f36 | 656e | 7469 | 7479 | 4676 | 2067 | 6574 | 5f65 | 6e74 | 6974 |
| 2523020 | 795f | 6669 | 6c65 | 5f5f | 3665 | 6e74 | 6974 | 7946 | 7620 | 6765 | 745f | 656e | 7469 | 7479 | 5f74 | 7970 | 655f | 5f36 | 656e | 7469 | 7479 | 4676 | 205c | 0067 |
| 2523100 | 6574 | 5f61 | 7263 | 685f | 6c69 | 6e65 | 5f5f | 3665 | 6e74 | 6974 | 7946 | 7620 | 6765 | 745f | 6361 | 6c6c | 5f6c | 696e | 655f | 5f36 | 656e | 7469 | 7479 | 4676 |
| 2523160 | 2067 | 6574 | 5f70 | 7263 | 735f | 6c69 | 6e65 | 5f5f | 3665 | 6e74 | 6974 | 7946 | 7620 | 6973 | 4754 | 455f | 5f36 | 656e | 7469 | 7479 | 4650 | 364f | 626a | 6563 |
| 2523240 | 7420 | 6973 | 4c54 | 455f | 5f36 | 656e | 7469 | 7479 | 4650 | 364f | 626a | 6563 | 7420 | 6578 | 706c | 6169 | 6e5f | 5f36 | 656e | 7469 | 7479 | 4650 | 6320 | 3b3b |
| 2523320 | 3b00 | 5f5f | 7074 | 626c | 5f5f | 3665 | 6e74 | 6974 | 795f | 5f44 | 6573 | 556e | 6974 | 5f63 | 7878 | 3a47 | 2830 | 2c33 | 3029 | 0062 | 6c6f | 636b | 3a54 | 2830 |
| 2523400 | 2c39 | 3429 | 3d73 | 3134 | 345f | 5f76 | 7074 | 725f | 5f36 | 4f62 | 6a65 | 6374 | 3a28 | 302c | 3330 | 292c | 302c | 3332 | 3b6e | 616d | 655f | 5f37 | 4e4f | 626a |
| 2523460 | 6563 | 743a | 2830 | 2c33 | 3129 | 2c33 | 322c | 3332 | 3b6e | 616d | 655f | 5f35 | 626c | 6f63 | 6b3a | 2830 | 2c33 | 3129 | 2c36 | 342c | 3332 | 3b74 | 7970 | 655f |
| 2523540 | 5f35 | 626c | 6f63 | 6b3a | 2830 | 2c31 | 292c | 3936 | 2c33 | 323b | 4d47 | 5f4e | 616d | 655f | 5f35 | 626c | 6f63 | 6b3a | 2830 | 2c33 | 3129 | 2c31 | 3238 | 2c33 |
| 2523620 | 323b | 4d47 | 5f54 | 7970 | 655f | 5f35 | 626c | 6f63 | 6b3a | 2830 | 2c33 | 3129 | 2c31 | 3630 | 2c33 | 323b | 4d47 | 5f53 | 7562 | 5479 | 7065 | 5f5f | 3562 | 6c6f |
| 2523700 | 636b | 3a28 | 302c | 3331 | 292c | 3139 | 322c | 3332 | 3b50 | 6172 | 656e | 745f | 5f35 | 626c | 6f63 | 6b3a | 2830 | 2c39 | 3329 | 2c32 | 3234 | 2c34 | 3830 | 3b5c |
| 2523760 | 004d | 4744 | 7363 | 7270 | 746e | 5f5f | 3562 | 6c6f | 636b | 3a28 | 302c | 3935 | 293d | 2a28 | 302c | 3931 | 292c | 3730 | 342c | 3332 | 3b41 | 6374 | 7561 | 6c5f |
| 2524040 | 5f35 | 626c | 6f63 | 6b3a | 2830 | 2c38 | 3029 | 2c37 | 3336 | 2c39 | 363b | 466f | 726d | 616c | 5f5f | 3562 | 6c6f | 636b | 3a28 | 302c | 3830 | 292c | 3833 | 322c |
| 2524120 | 3936 | 3b52 | 6573 | 6f6c | 7665 | 645f | 5f35 | 626c | 6f63 | 6b3a | 2830 | 2c38 | 3029 | 2c39 | 3238 | 2c39 | 363b | 4174 | 7472 | 6962 | 7574 | 6573 | 5f5f | 3562 |
| 2524200 | 6c6f | 636b | 3a28 | 302c | 3830 | 292c | 3130 | 3234 | 2c39 | 363b | 4572 | 7253 | 7461 | 7475 | 735f | 5f35 | 626c | 6f63 | 6b3a | 2830 | 2c31 | 292c | 3131 | 3230 |
| 2524260 | 2c33 | 323b | 3b00 | 626c | 6f63 | 6b3a | 5a63 | 626c | 6f63 | 6b3b | 4e4f | 626a | 6563 | 743b | 5f5f | 6374 | 5f5f | 3562 | 6c6f | 636b | 4676 | 205f | 5f63 | 745f |
| 2524340 | 5f35 | 626c | 6f63 | 6b46 | 5243 | 3562 | 6c6f | 636b | 205f | 5f64 | 745f | 5f35 | 626c | 6f63 | 6b46 | 7620 | 7365 | 745f | 626c | 6f63 | 6b5f | 6e61 | 6d65 | 5f5f |
| 2524420 | 3562 | 6c6f | 636b | 4650 | 6320 | 7365 | 745f | 626c | 6f63 | 6b5f | 7479 | 7065 | 5f5f | 3562 | 6c6f | 636b | 4650 | 6320 | 6765 | 745f | 626c | 6f63 | 6b5f | 6e61 |
| 2524500 | 6d65 | 5f5f | 3562 | 6c6f | 636b | 4676 | 2067 | 6574 | 5f62 | 6c6f | 636b | 5f74 | 7970 | 655f | 5f35 | 626c | 6f63 | 6b46 | 7620 | 6765 | 745f | 626c | 6f63 | 6b5f |
| 2524560 | 7361 | 7265 | 6e74 | 5f5f | 3562 | 6c6f | 636b | 4676 | 205c | 0067 | 6574 | 5f62 | 6c6f | 636b | 5f4d | 6f64 | 4765 | 6e5f | 5f35 | 626c | 6f63 | 6b46 | 7620 | 6765 |
| 2524640 | 745f | 466f | 726d | 616c | 5f5f | 3562 | 6c6f | 636b | 4676 | 2067 | 6574 | 5f41 | 6374 | 7561 | 6c5f | 5f35 | 626c | 6f63 | 6b46 | 7620 | 6765 | 745f | 5265 | 736f |
| 2524720 | 6c76 | 6564 | 5f5f | 3562 | 6c6f | 636b | 4676 | 2067 | 6574 | 5f41 | 7474 | 7269 | 6275 | 7465 | 5f5f | 3562 | 6c6f | 636b | 4676 | 2073 | 6574 | 4572 | 726f | 725f |
| 2525000 | 5f35 | 626c | 6f63 | 6b46 | 6320 | 6765 | 7445 | 7272 | 6f72 | 5f5f | 3562 | 6c6f | 636b | 4676 | 2067 | 6574 | 5f63 | 6f6d | 705f | 6c65 | 6e67 | 7468 | 5f5f | 3562 |
| 2525060 | 6c6f | 636b | 4676 | 2069 | 7351 | 7561 | 6c69 | 6669 | 6564 | 5f5f | 3562 | 6c6f | 636b | 4676 | 205c | 0069 | 734c | 5445 | 5f5f | 3562 | 6c6f | 636b | 4650 | 364f |
| 2525140 | 626a | 6563 | 7420 | 6973 | 4754 | 455f | 5f35 | 626c | 6f63 | 6b46 | 5036 | 4f62 | 6a65 | 6374 | 2065 | 7870 | 6c61 | 696e | 5f5f | 3562 | 6c6f | 636b | 4650 | 6320 |
| 2525220 | 5265 | 7665 | 7273 | 6541 | 6c6c | 4c69 | 7374 | 735f | 5f35 | 626c | 6f63 | 6b46 | 7620 | 4368 | 6563 | 6b50 | 6172 | 614c | 6973 | 7473 | 5f5f | 3562 | 6c6f | 636b |
| 2525300 | 4676 | 2043 | 6865 | 636b | 5061 | 7261 | 6d4c | 6973 | 745f | 5f35 | 626c | 6f63 | 6b46 | 5035 | 504c | 6973 | 7420 | 6765 | 745f | 5648 | 444c | 5f43 | 6f6d | 704c |
| 2525360 | 6162 | 6c65 | 5f5f | 3562 | 6c6f | 636b | 4650 | 6320 | 6765 | 745f | 5648 | 444c | 5f43 | 6f6d | 704e | 616d | 655f | 5f35 | 626c | 6f63 | 6b46 | 5063 | 205c | 0057 |
| 2525440 | 5f4d | 475f | 436f | 6170 | 4473 | 6372 | 7074 | 6e5f | 5f35 | 626c | 6f63 | 6b46 | 7620 | 575f | 4d47 | 5f43 | 6865 | 636b | 436f | 6170 | 5f5f | 3562 | 6c6f | 636b |
| 2525520 | 4676 | 2057 | 5f56 | 4844 | 4c5f | 436f | 6d70 | 496e | 7374 | 5f5f | 3562 | 6c6f | 636b | 4676 | 2057 | 5f56 | 4844 | 4c5f | 436f | 6d70 | 4465 | 635f | 5f35 | 626c |
| 2525600 | 6f63 | 6b46 | 7620 | 575f | 434c | 5f41 | 7263 | 6842 | 6f64 | 795f | 5f35 | 626c | 6f63 | 6b46 | 7620 | 575f | 434c | 5f45 | 6e74 | 6974 | 7944 | 6563 | 5f5f | 3562 |
| 2525660 | 6c6f | 636b | 4676 | 203b | 3b3b | 005f | 5f70 | 7452 | 6c5f | 5f35 | 626c | 6f63 | 6b5f | 5f44 | 6573 | 556e | 6974 | 5f63 | 7878 | 3a47 | 2830 | 2c33 | 3029 | 005f |
| 2525740 | 5f63 | 745f | 5f36 | 656e | 7469 | 7479 | 4676 | 3a66 | 2830 | 2c39 | 3629 | 3d2a | 2830 | 2c39 | 3329 | 005f | 5f30 | 7468 | 6973 | 3a70 | 2830 | 2c39 | 3629 | 002e |
| 2526020 | 2f68 | 7878 | 2f65 | 6e74 | 6974 | 792e | 6878 | 7800 | 5f5f | 3074 | 6869 | 733a | 7228 | 302c | 3936 | 2900 | 5f5f | 3074 | 6869 | 7320 | 3a5a | 746c | 005f | 5f63 |
| 2526100 | 745f | 5f36 | 656e | 7469 | 7479 | 4676 | 203a | 5a74 | 4600 | 4465 | 7369 | 676e | 556e | 6974 | 3a54 | 2830 | 2c39 | 3729 | 3d73 | 3532 | 5f5f | 7670 | 7472 | 5f5f |
| 2526160 | 364f | 626a | 6563 | 743a | 2830 | 2c33 | 3029 | 2c30 | 2c33 | 323b | 6e61 | 6d65 | 5f5f | 374e | 4f62 | 6a65 | 6374 | 3a28 | 302c | 3331 | 292c | 3332 | 2c33 | 323b |

```
2526240  4465 556e 4e61 6465 5f5f 3130 4465 7369 676e 556e 6974 3a28 302c 3331 292c 3634 2c33 323b 4669 6c65 4e61 6d65 5f5f 3130
2526320  4465 7369 676e 556e 6974 3a28 302c 3331 292c 3936 2c33 323b 4172 6368 4e61 6d65 5f5f 3130 4465 7369 676e 556e 6974 3a28
2526400  302c 3331 292c 3132 382c 3332 3b44 6555 6e54 7970 655f 5f31 3044 6573 6967 6e55 6e69 743a 2830 2c31 292c 3136 302c 3332
2526460  3b41 7263 684c 696e 655f 5f31 3044 6573 6967 6e55 6e69 743a 2830 2c31 292c 3139 322c 3332 3b51 7561 6c69 6669 6564 5f5f
2526540  3130 4465 7369 676e 556e 6974 3a28 302c 3830 292c 3232 382c 3936 3b53 7562 426c 6f63 6b73 5f5f 3130 4465 7369 676e 556e
2526620  6974 3a28 302c 3830 292c 3332 302c 3936 3b3b 0044 6573 6967 6e55 6e69 743a 5a63 4465 7369 676e 556e 6974 3b4e 4f62 6a65
2526700  6374 3b5f 5f63 745f 5f31 3044 6573 6967 6e55 6e69 7446 7620 5f5f 6374 5f5f 3130 4465 7369 676e 556e 6974 4650 6320 5f5f
2526760  6374 5f5f 3130 4465 7369 676e 556e 6974 4650 3665 6e74 6974 7920 5f5f 6374 5f5f 3130 4465 7369 676e 556e 6974 4652 4331
2527040  3044 6573 6967 6e55 6e69 7420 5f5f 6474 5f5f 3130 4465 7369 676e 556e 6974 4676 2073 6574 5f44 555f 4465 556e 4e61 6d65
2527120  5f5f 3130 4465 7369 676e 556e 6974 4650 6320 5c00 7365 745f 4455 5f46 696c 654e 616d 655f 5f31 3044 6573 6967 6e55 6e69
2527200  7446 5063 2073 6574 5f44 555f 4172 6368 4e61 6465 5f5f 3130 4465 7369 676e 556e 6974 4650 6320 7365 745f 4455 5f44 6555
2527260  6e54 7970 655f 5f31 3044 6573 6967 6e55 6e69 7446 6920 7365 745f 4455 5f41 7263 684c 696e 655f 5f31 3044 6573 6967 6e55
2527340  6e69 7446 6920 6765 745f 4455 5f46 696c 654e 616d 655f 5f31 3044 6573 6967 6e55 6e69 7446 7620 4571 7561 6c5f 5f31 3044
2527420  6573 6967 6e55 6e69 7446 5036 656e 7469 7479 205c 0069 7347 5445 5f5f 3130 4465 7369 676e 556e 6974 4650 364f 626a 6563
2527500  7420 6973 4c54 455f 5f31 3044 6573 6967 6e55 6e69 7446 5036 4f62 6a65 6374 2067 6574 5f44 555f 5175 616c 6966 6965 645f
2527560  5f31 3044 6573 6967 6e55 6e69 7446 7620 6765 745f 4455 5f53 7562 426c 6f63 6b73 5f5f 3130 4465 7369 676e 556e 6974 4676
2527640  2045 7870 616e 645f 5648 444c 5f44 555f 5f31 3044 6573 6967 6e55 6e69 7446 7620 6578 706c 6169 6e5f 5f31 3044 6573 6967
2527720  6e55 6e69 7446 5063 203b 3b3b 005f 5f70 7462 6c5f 5f31 3044 6573 6967 6e55 6e69 745f 5f44 6573 556e 6974 5f63 7878 3a47
2530000  2830 2c33 3029 0049 4f4d 3a47 2830 2c39 3829 3d2a 2830 2c39 3229 0044 6573 556e 6974 2e63 7878 005f 5f63 745f 5f31 3044
2530060  6573 6967 6e55 6e69 7446 5036 656e 7469 7479 3a46 2830 2c39 3929 3d2a 2830 2c39 3729 005f 5f30 7468 6973 3a70 2830 2c39
2530140  3929 005f 5f30 453a 7028 302c 3936 2900 5f5f 3074 6869 733a 7228 302c 3939 2900 5f5f 305f 5f58 7330 3061 7a32 306a 6f3a
2530220  2830 2c33 3129 005f 5f30 5f5f 5873 3030 6134 3230 6a6f 3a28 302c 3331 2900 5f5f 305f 5f58 7330 3071 3132 306a 6f3a 2830
2530300  2c33 3129 005f 5f30 5f5f 5869 3030 7161 3330 6a6f 3a28 302c 3129 005f 5f30 5f5f 5869 3030 6164 6631 6a6f 3a28 302c 3129
2530360  005f 5f30 7468 6973 203a 5a74 6c00 5f5f 3045 203a 5a74 6c00 5f5f 305f 5f58 7330 3061 7a32 306a 6f20 3a5a 746c 005f 5f30
2530440  5f5f 5873 3030 6134 3230 6a6f 203a 5a74 6c00 5f5f 305f 5f58 7330 3071 3132 306a 6f20 3a5a 746c 005f 5f30 5f5f 5869 3030
2530520  7161 3330 6a6f 203a 5a74 6c00 5f5f 305f 5f58 6930 3061 6466 316a 6f20 3a5a 746c 005f 5f63 745f 5f31 3044 6573 6967 6e55
2530600  6e69 7446 5036 656e 7469 7479 203a 5a74 4600 4571 7561 6c5f 5f31 3044 6573 6967 6e55 6e69 7446 5036 656e 7469 7479 3a46
2530660  2830 2c31 2900 5f5f 3074 6869 733a 7028 302c 3939 2900 5f5f 3045 3a70 2830 2c39 3629 005f 5f30 7468 6973 3a72 2830 2c39
2530740  3929 005f 5f30 7468 6973 203a 5a74 6c00 5f5f 3045 203a 5a74 6c00 4571 7561 6c5f 5f31 3044 6573 6967 6e55 6e69 7446 5036
2531020  656e 7469 7479 203a 5a74 4600 6973 4754 455f 5f31 3044 6573 6967 6e55 6e69 7446 5036 4f62 6a65 6374 3a46 2830 2c31 2900
2531100  5f5f 3074 6869 733a 7028 302c 3939 2900 5f5f 3044 3a70 2830 2c31 3030 293d 2a28 302c 3731 2900 5f5f 3144 553a 2830 2c39
2531160  3929 005f 5f30 7468 6973 203a 5a74 6c00 5f5f 3044 203a 5a74 6c00 5f5f 3144 5520 3a5a 746c 0069 7347 5445 5f5f 3130 4465
2531240  7369 676e 556e 6974 4650 364f 626a 6563 7420 3a5a 7446 0069 734c 5445 5f5f 3130 4465 7369 676e 556e 6974 4650 364f 626a
2531320  6563 743a 4628 302c 3129 005f 5f30 7468 6973 3a70 2830 2c39 3929 005f 5f30 443a 7028 302c 3130 3029 005f 5f31 4455 3a28
2531400  302c 3939 2900 5f5f 3074 6869 7320 3a5a 746c 005f 5f30 4420 3a5a 746c 005f 5f31 4455 203a 5a74 6c00 6973 4c54 455f 5f31
2531460  3044 6573 6967 6e55 6e69 7446 5036 4f62 6a65 6374 203a 5a74 4600 4579 7061 6e64 5f56 4844 4c5f 4455 5f5f 3130 4465 7369
2531540  676e 556e 6974 4676 3a46 2830 2c32 2900 5f5f 3074 6869 733a 7028 302c 3939 2900 5f5f 3074 6869 733a 7228 302c 3939 2900
2531620  5f5f 3174 656d 703a 2830 2c31 3031 293d 6172 2830 2c31 293b 303b 3531 313b 2830 2c32 2900 5f5f 316c 6566 744f 7665 723a
2531700  2830 2c33 3129 005f 5f31 4c3a 2830 2c37 3629 005f 5f31 423a 2830 2c31 3032 293d 2a28 302c 3934 2900 5f5f 314c 493a 2830
2531760  2c38 3129 005f 5f30 5f5f 5874 6869 7330 3079 6e6a 7a6a 6f3a 2830 2c39 3829 005f 5f30 5f5f 5874 6869 7330 3061 6433 7a6a
2532040  6f3a 2830 2c39 3529 005f 5f30 7468 6973 203a 5a74 6c00 5f5f 3174 656d 7020 3a5a 746c 005f 5f31 6c65 6674 4f76 6572 203a
2532120  5a74 6c00 5f5f 314c 203a 5a74 6c00 5f5f 3142 203a 5a74 6c00 5f5f 314c 4920 3a5a 746c 005f 5f30 5f5f 5874 6869 7330 3079
2532200  6e6a 7a6a 6f20 3a5a 746c 005f 5f30 5f5f 5874 6869 7330 3061 6433 7a6a 6f20 3a5a 746c 0045 7870 616e 645f 5648 444c 5f44
2532260  555f 5f31 3044 6573 6967 6e55 6e69 7446 7620 3a5a 7446 005f 5f73 7469 5f5f 4465 7355 6e69 745f 6378 785f 494f 4d5f 3a46
2532340  2830 2c32 2900 2f75 7372 2f43 432f 7375 6e34 2f69 6e63 6c2f 696f 7374 7265 616d 2e68 005f 5f73 7464 5f5f 4465 7355 6e69
2532420  745f 6378 785f 494f 4d5f 3a46 2830 2c32 2900 5f5f 7674 626c 5f5f 3130 4465 7369 676e 556e 6974 3a47 2830 2c31 3033 293d
2532500  6172 2830 2c31 293b 303b 3130 3b28 302c 3135 2900 5f5f 7674 626c 5f5f 384c 504f 626a 6563 745f 5f44 6573 556e 6974 5f63
2532560  7878 3a47 2830 2c31 3034 293d 6172 2830 2c31 293b 303b 333b 2830 2c31 3529 0065 7870 6c61 696e 5f5f 3130 4465 7369 676e
2532640  556e 6974 4650 633a 6628 302c 3229 005f 5f30 7468 6973 3a70 2830 2c39 3929 005f 5f30 733a 7028 302c 3331 2900 2e2f 6878
2532720  782f 4465 7355 6e69 742e 6878 7800 5f5f 3074 6869 733a 7228 302c 3939 2900 5f5f 3074 6869 7320 3a5a 746c 005f 5f30 7320
2533000  3a5a 746c 0065 7870 6c61 696e 5f5f 3130 4465 7369 676e 556e 6974 4650 6320 3a5a 7446 0065 7870 6c61 696e 5f5f 384c 504f
2533060  626a 6563 7446 5063 3a66 2830 2c32 2900 5f5f 3074 6869 733a 7028 302c 3130 3529 3d2a 2830 2c37 3729 005f 5f30 733a 7028
2533140  302c 3331 2900 2f68 6f6d 652f 6f73 6173 312f 612f 6162 2f73 7263 2f6e 6577 6f62 6a65 6374 732f 6878 782f 4c50 4f62 6a65
2533220  6374 5f64 622e 6878 7800 5f5f 3074 6869 733a 7228 302c 3130 3529 005f 5f30 7468 6973 203a 5a74 6c00 5f5f 3073 203a 5a74
2533300  6c00 6578 706c 6169 6e5f 5f38 4c50 4f62 6a65 6374 4650 6320 3a5a 7446 0073 6574 5072 6f70 5f5f 374e 4f62 6a65 6374 4650
```

2533360 6366 3a66 2830 2c32 2900 5f5f 3074 6869 733a 7028 302c 3738 2900 5f5f 315f 5f41 3336 3a70 2830 2c33 3129 005f 5f31 5f5f
2533440 4133 373a 7028 302c 3130 2900 2f68 6f6d 652f 6f73 6173 312f 612f 6162 2f73 7263 2f6e 6577 6f62 6a65 6374 732f 6878 782f
2533520 4e4f 626a 6563 745f 6462 2e68 7878 005f 5f30 7468 6973 203a 5a74 6c00 5f5f 315f 5f41 3336 203a 5a74 6c00 5f5f 315f 5f41
2533600 3337 203a 5a74 6c00 7365 7450 726f 705f 5f37 4e4f 626a 6563 7446 5063 6620 3a5a 7446 0073 6574 5072 6f70 5f5f 374e 4f62
2533660 6a65 6374 4650 6369 3a66 2830 2c32 2900 5f5f 3074 6869 733a 7028 302c 3738 2900 5f5f 315f 5f41 3334 3a70 2830 2c33 3129
2533740 005f 5f31 5f5f 4133 353a 7028 302c 3129 005f 5f30 7468 6973 203a 5a74 6c00 5f5f 315f 5f41 3334 203a 5a74 6c00 5f5f 315f
2534020 5f41 3335 203a 5a74 6c00 7365 7450 726f 705f 5f37 4e4f 626a 6563 7446 5063 6920 3a5a 7446 0073 6574 5072 6f70 5f5f 374e
2534100 4f62 6a65 6374 4650 6354 313a 6628 302c 3229 005f 5f30 7468 6973 3a70 2830 2c37 3829 005f 5f31 5f5f 4133 323a 7028 302c
2534160 3331 2900 5f5f 315f 5f41 3333 3a70 2830 2c33 3129 005f 5f30 7468 6973 203a 5a74 6c00 5f5f 315f 5f41 3332 203a 5a74 6c00
2534240 5f5f 315f 5f41 3333 203a 5a74 6c00 7365 7450 726f 705f 5f37 4e4f 626a 6563 7446 5063 5431 203a 5a74 4600 6765 7450 726f
2534320 705f 5f37 4e4f 626a 6563 7446 5063 693a 6628 302c 3331 2900 5f5f 3074 6869 733a 7028 302c 3738 2900 5f5f 305f 5f41 3330
2534400 3a70 2830 2c33 3129 005f 5f30 5f5f 4133 313a 7028 302c 3129 005f 5f30 7468 6973 203a 5a74 6c00 5f5f 305f 5f41 3330 203a
2534460 5a74 6c00 5f5f 305f 5f41 3331 203a 5a74 6c00 6765 7450 726f 705f 5f37 4e4f 626a 6563 7446 5063 6920 3a5a 7446 0067 6574
2534540 4174 7472 5f5f 374e 4f62 6a65 6374 4669 3a66 2830 2c33 3129 005f 5f30 7468 6973 3a70 2830 2c37 3829 005f 5f30 5f5f 4132
2534620 393a 7028 302c 3129 005f 5f30 7468 6973 203a 5a74 6c00 5f5f 305f 5f41 3239 203a 5a74 6c00 6765 7441 7474 725f 5f37 4e4f
2534700 626a 6563 7446 6920 3a5a 7446 0069 6e4f 7264 6572 5f5f 364f 626a 6563 7446 5036 4f62 6a65 6374 3a66 2830 2c31 2900 5f5f
2534760 3074 6869 733a 7028 302c 3130 3029 005f 5f30 5f5f 4132 373a 7028 302c 3130 3029 002f 686f 6d65 2f6f 7361 7331 2f61 2f61
2535040 622f 7372 632f 6e65 776f 626a 6563 7473 2f68 7878 2f4f 626a 6563 745f 6462 2e68 7878 005f 5f30 7468 6973 203a 5a74 6c00
2535120 5f5f 305f 5f41 3237 203a 5a74 6c00 696e 4f72 6465 725f 5f36 4f62 6a65 6374 4650 364f 626a 6563 7420 3a5a 7446 0046 696c
2535200 6555 6e2e 6f00 5f73 6574 5072 6f70 5f5f 374e 4f62 6a65 6374 4650 6366 005f 7365 7450 726f 705f 5f37 4e4f 626a 6563 7446
2535260 5063 6900 5f67 6574 4174 7472 5f5f 374e 4f62 6a65 6374 4669 005f 5f5f 6474 5f5f 3130 494f 5f4d 616e 6167 6572 4676 005f
2535340 7365 745f 4655 5f46 696c 654e 616d 655f 5f38 4669 6c65 556e 6974 4650 6300 5f70 7574 5f5f 376f 7374 7265 616d 4663 005f
2535420 7365 7450 726f 705f 5f37 4e4f 626a 6563 7446 5063 5431 005f 696f 7374 7265 616d 5f69 6e69 7400 5f69 734c 5445 5f5f 374e
2535500 4f62 6a65 6374 4650 364f 626a 6563 7400 5f69 7347 5445 5f5f 374e 4f62 6a65 6374 4650 364f 626a 6563 7400 5f65 7870 6c61
2535560 696e 5f5f 384c 504f 626a 6563 7446 5063 005f 6765 7450 726f 705f 5f37 4e4f 626a 6563 7446 5063 6900 5f5f 5f63 745f 5f36
2535640 656e 7469 7479 4676 005f 696e 4f72 6465 725f 5f36 4f62 6a65 6374 4650 364f 626a 6563 7400 2f68 6f6d 652f 6f73 6173 312f
2535720 612f 6162 2f73 7263 2f6e 6577 6f62 6a65 6374 732f 7072 6f67 2f43 2b2b 2e31 3932 3634 2f00 4669 6c65 556e 2e63 0046 696c
2536000 6555 6e2e 6378 7800 696e 743a 7428 302c 3129 3d72 2830 2c31 293b 2d32 3134 3734 3833 3634 383b 3231 3437 3438 3336 3437
2536060 3b00 6368 6172 3a74 2830 2c32 293d 7228 302c 3229 3b30 3b31 3237 3b00 6c6f 6e67 3a74 2830 2c33 293d 7228 302c 3129 3b2d
2536140 3231 3437 3438 3336 3438 3b32 3134 3734 3833 3634 373b 0073 686f 7274 3a74 2830 2c34 293d 7228 302c 3129 3b2d 3332 3736
2536220 383b 3332 3736 373b 0075 6e73 6967 6e65 6420 6368 6172 3a74 2830 2c35 293d 7228 302c 3129 3b30 3b32 3535 3b00 756e 7369
2536300 676e 6564 2073 636f 7274 3a74 2830 2c36 2931 7228 302c 3129 3b30 3b36 3535 3335 3b00 756e 7369 676e 6564 206c 6f6e 673a
2536360 7428 302c 3729 3d72 2830 2c31 293b 303b 2d31 3b00 756e 7369 676e 6564 2069 6e74 3a74 2830 2c38 293d 7228 302c 3129 3b30
2536440 3b2d 313b 0066 6c6f 6174 3a74 2830 2c39 2931 7228 302c 3129 3b34 3b30 3b00 646f 7562 6c65 3a74 2830 2c31 3029 3d72 2830
2536520 2c31 293b 383b 303b 0076 6f69 643a 7428 302c 3131 293d 2830 2c31 3129 003f 3f3f 3a74 2830 2c31 3229 3d28 302c 3129 005f
2536600 5f76 7074 703a 7428 302c 3133 293d 2a28 302c 3134 293d 6628 302c 3129 005f 5f6d 7074 723a 5428 302c 3135 293d 7338 643a
2536660 2830 2c34 292c 302c 3136 3b69 3a28 302c 3429 2c31 362c 3136 3b66 3a28 302c 3133 292c 3332 2c33 323b 3b00 5f50 4656 5f3a
2536740 7428 302c 3136 293d 2a28 302c 3137 293d 6628 302c 3229 005f 5046 495f 3a74 2830 2c31 3329 0073 7472 6561 6d70 6f73 3a74
2537020 2830 2c31 2900 7174 7265 616d 6f66 663a 7428 302c 3129 0069 6f5f 7374 6174 653a 5428 302c 3138 293d 6567 6f6f 6462 6974
2537100 5f5f 696f 5f73 7461 7465 3a30 2c65 6f66 6269 745f 5f69 6f5f 7374 6174 653a 312c 6661 696c 6269 745f 5f69 6f5f 7374 6174
2537160 653a 322c 6261 6462 6974 5f5f 696f 5f73 7461 7465 3a33 2c68 6172 6466 6169 6c5f 5f69 6f5f 7374 6174 653a 342c 3b00 6f70
2537240 656e 5f6d 6f64 653a 5428 302c 3139 293d 6569 6e5f 5f6f 7065 6e5f 6d6f 6465 3a30 2c6f 7574 5f5f 6f70 656e 5f6d 6f64 653a
2537320 312c 6174 655f 5f6f 7065 6e5f 6d6f 6465 3a32 2c61 7070 5f5f 6f70 656e 5f6d 6f64 653a 332c 7472 756e 635f 5f6f 7065 6e5f
2537400 6d6f 6465 3a34 2c6e 6f63 7265 6174 655f 5f6f 7065 6e5f 6d6f 6465 3a35 2c6e 6f72 6570 6c61 6365 5f5f 6f70 656e 5f6d 6f64
2537460 653a 362c 3b00 7365 656b 5f64 6972 3a54 2830 2c32 3029 3d65 6265 675f 5f73 6565 6b5f 6469 723a 302c 6375 725f 5f73 6565
2537540 6b5f 6469 723a 312c 656e 645f 5f73 6565 6b5f 6469 723a 322c 3b00 5f5f 4531 3a54 2830 2c32 3129 3d65 736b 6970 7773 5f5f
2537620 5f5f 4531 3a30 2c6c 6566 745f 5f5f 5f45 313a 312c 7269 6768 745f 5f5f 5f45 313a 322c 696e 7465 726e 616c 5f5f 5f5f 4531
2537700 3a33 2c64 6563 5f5f 5f5f 4531 3a34 2c6f 6374 5f5f 5f5f 4531 3a35 2c68 6578 5f5f 5f5f 4531 3a36 2c73 686f 7762 6173 655f
2537760 5f5f 5f45 313a 372c 5c00 7368 6f77 706f 696e 745f 5f5f 5f45 313a 382c 7570 7065 7263 6173 655f 5f5f 5f45 313a 392c 7368
2540040 6f77 706f 735f 5f5f 5f45 313a 3130 2c73 6369 656e 7469 6669 635f 5f5f 5f45 313a 3131 2c66 6978 6564 5f5f 5f5f 4531 3a31
2540120 322c 756e 6974 6275 665f 5f5f 5f45 313a 3133 2c73 7464 696f 5f5f 5f5f 4531 3a31 342c 3b00 5f5f 4532 3a54 2830 2c32 3229
2540200 3d65 736b 6970 7069 6e67 5f5f 5f5f 4532 3a30 2c74 6965 645f 5f5f 5f45 323a 312c 3b00 696f 733a 5428 302c 3233 293d 7336
2540260 306e 7573 6572 5f5f 3369 6f73 3a28 302c 3129 2c30 2c33 323b 785f 7573 6572 5f5f 3369 6f73 3a28 302c 3237 293d 2a28 302c
2540340 3234 293d 7875 696f 735f 7573 6572 5f75 6e69 6f6e 3a2c 3332 2c33 323b 6270 5f5f 3369 6f73 3a28 302c 3238 293d 2a28 302c
2540420 3235 293d 7873 7374 7265 616d 6275 663a 2c36 342c 3332 3b73 7461 7465 5f5f 3369 6f73 3a28 302c 3129 2c39 362c 3332 3b69

```
2540500  7370 6563 6961 6c5f 5f33 696f 733a 2830 2c31 292c 3132 382c 3332 3b6f 7370 6563 6961 6c5f 5f33 696f 733a 2830 2c31 292c
2540560  3136 302c 3332 3b69 7366 785f 7370 6563 6961 6c5f 5f33 696f 733a 2830 2c31 292c 3139 322c 3332 3b6f 7366 785f 7370 6563
2540640  6961 6c5f 5f33 696f 733a 2830 2c31 292c 3232 342c 3332 3b5c 0064 656c 6275 665f 5f33 696f 733a 2830 2c31 292c 3235 362c
2540720  3332 3b78 5f74 6965 5f5f 3369 6f73 3a28 302c 3239 293d 2a28 302c 3236 293d 7873 6f73 7472 6561 6d3a 2c32 3838 2c33 323b
2541000  785f 666c 6167 735f 5f33 696f 733a 2830 2c31 292c 3332 302c 3332 3b78 5f70 7265 6369 7369 6f6e 5f5f 3369 6f73 3a28 302c
2541060  3429 2c33 3532 2c31 363b 785f 6669 6c6c 5f5f 3369 6f73 3a28 302c 3229 2c33 3638 2c38 3b78 5f77 6964 7468 5f5f 3369 6f73
2541140  3a28 302c 3429 2c33 3834 2c31 363b 6173 7369 676e 5f70 7269 7661 7465 5f5f 3369 6f73 3a28 302c 3129 2c34 3136 2c33 323b
2541220  5f5f 7670 7472 5f5f 3369 6f73 3a28 302c 3330 293d 2a28 302c 3135 292c 3434 382c 3332 3b3b 0062 6173 6566 6965 6c64 5f5f
2541300  3369 6f73 3a47 2830 2c31 2900 6164 6a75 7374 6669 656c 645f 5f33 696f 733a 4728 302c 3129 0066 6c6f 6174 6669 656c 645f
2541360  5f33 696f 733a 4728 302c 3129 006e 6578 7462 6974 5f5f 3369 6f73 3a47 2830 2c31 2900 6e65 7874 776f 7264 5f5f 3369 6f73
2541440  3a47 2830 2c31 2900 7374 6469 6f66 6c75 7368 5f5f 3369 6f73 3a47 2830 2c31 3629 0069 6f73 3a5a 6369 6f73 3b3b 5f5f 6374
2541520  5f5f 3369 6f73 4550 3973 7472 6561 6d62 7566 205f 5f63 745f 5f33 696f 7346 7620 5f5f 6374 5f5f 3369 6f73 4652 3369 6f73
2541600  205f 5f64 745f 5f33 696f 7346 7620 666c 6167 735f 5f33 696f 7346 7620 666c 6167 735f 5f33 696f 7346 6c20 7365 7466 5f5f
2541660  3369 6f73 466c 5431 2073 6574 665f 5f33 696f 7346 6c20 756e 7365 7466 5f5f 3369 6f73 466c 2077 6964 7468 5f5f 3369 6f73
2541740  4676 2077 6964 7468 5f5f 3369 6f73 4669 2074 6965 5f5f 3369 6f73 4650 376f 7374 7265 616d 205c 0074 6965 5f5f 3369 6f73
2542020  4676 2066 696c 6c5f 5f33 696f 7346 6320 6669 6c6c 5f5f 3369 6f73 4676 2070 7265 6369 7369 6f6e 5f5f 3369 6f73 4669 2070
2542100  7265 6369 7369 6f6e 5f5f 3369 6f73 4676 2072 6473 7461 7465 5f5f 3369 6f73 4676 205f 5f6f 7050 765f 5f33 696f 7346 7620
2542160  5f5f 6e74 5f5f 3369 6f73 4676 2065 6f66 5f5f 3369 6f73 4676 2066 6169 6c5f 5f33 696f 7346 7620 6261 645f 5f33 696f 7346
2542240  7620 676f 6f64 5f5f 3369 6f73 4676 2063 6c65 6172 5f5f 3369 6f73 4669 2072 6462 7566 5f5f 3369 6f73 4676 205c 0069 776f
2542320  7264 5f5f 3369 6f73 4669 2070 776f 7264 5f5f 3369 6f73 4669 2062 6974 616c 6c6f 635f 5f33 696f 7353 4676 2078 616c 6c6f
2542400  635f 5f33 696f 7353 4676 2075 7265 7369 7a65 5f5f 3369 6f73 4669 2073 796e 635f 7769 7468 5f73 7464 696f 5f5f 3369 6f73
2542460  5346 7620 7365 7473 7461 7465 5f5f 3369 6f73 4669 2069 6e69 745f 5f33 696f 7346 5039 7374 7265 616d 6275 6620 5f5f 6173
2542540  5f5f 3369 6f73 4652 3369 6f73 2073 6b69 705f 5f33 696f 7346 6920 3b62 6173 6566 6965 6c64 5f5f 3369 6f73 205c 0061 646a
2542620  7573 7466 6965 6c64 5f5f 3369 6f73 2066 6c6f 6174 6669 656c 645f 5f33 696f 7320 6e65 7874 6269 745f 5f33 696f 7320 6e65
2542700  7874 776f 7264 5f5f 3369 6f73 2073 7464 696f 666c 7573 685f 5f33 696f 7320 3b3b 0073 7472 6561 6d62 7566 3a54 2830 2c32
2542760  3529 3d73 3430 616c 6c6f 635f 5f39 7374 7265 616d 6275 663a 2830 2c34 292c 302c 3136 3b78 5f75 6e62 7566 5f5f 3973 7472
2543040  6561 6d62 7566 3a28 302c 3429 2c31 362c 3136 3b78 5f62 6173 655f 5f39 7374 7265 616d 6275 663a 2830 2c33 3129 3d2a 2830
2543120  2c32 292c 3332 2c33 323b 785f 7062 6173 655f 5f39 7374 7265 616d 6275 663a 2830 2c33 3129 2c36 342c 3332 3b78 5f70 7074
2543200  725f 5f39 7374 7265 616d 6275 663a 2830 2c33 3129 2c39 362c 3332 3b78 5f65 7070 7472 5f5f 3973 7472 6561 6d62 7566 3a28
2543260  302c 3331 292c 3132 382c 3332 3b78 5f67 7074 725f 5f39 7374 7265 616d 6275 663a 2830 2c33 3129 2c31 3630 2c33 323b 785f
2543340  6567 7074 725f 5f39 7374 7265 616d 6275 663a 2830 2c33 3129 2c31 3932 2c33 323b 5c00 785f 6562 6163 6b5f 5f39 7374 7265
2543420  616d 6275 663a 2830 2c33 3129 2c32 3234 2c33 323b 785f 626c 656e 5f5f 3973 7472 6561 6d62 7566 3a28 302c 3129 2c32 3536
2543500  2c33 323b 5f5f 7670 7472 5f5f 3973 7472 6561 6d62 7566 3a28 302c 3330 292c 3238 382c 3332 3b3b 0073 7472 6561 6d62 7566
2543560  3a5a 6373 7472 6561 6d62 7566 3b3b 5f5f 6374 5f5f 3973 7472 6561 6d62 7566 4652 3973 7472 6561 6d62 7566 205f 5f63 745f
2543640  5f39 7374 7265 616d 6275 6646 7620 5f5f 6374 5f5f 3973 7472 6561 6d62 7566 4650 6369 205f 5f63 745f 5f39 7374 7265 616d
2543720  6275 6646 5063 6954 3220 5f5f 6173 5f5f 3973 7472 6561 6d62 7566 4652 3973 7472 6561 6d62 7566 2064 6270 5f5f 3973 7472
2544000  6561 6d62 7566 4676 2062 6173 655f 5f39 7374 7265 616d 6275 6646 7620 7062 6173 655f 5f39 7374 7265 616d 6275 6646 7620
2544060  5c00 7070 7472 5f5f 3973 7472 6561 6d62 7566 4676 2065 7070 7472 5f5f 3973 7472 6561 6d62 7566 4676 2067 7074 725f 5f39
2544140  7374 7265 616d 6275 6646 7620 6567 7074 725f 5f39 7374 7265 616d 6275 6646 7620 6562 6163 6b5f 5f39 7374 7265 616d 6275
2544220  6646 7620 6562 7566 5f5f 3973 7472 6561 6162 7566 4676 2062 6c65 6e5f 5f39 7374 7265 616d 6275 6646 7620 7365 7470 5f5f
2544300  3973 7472 6561 6d62 7566 4650 6354 3120 7365 7467 5f5f 3973 7472 6561 6d62 7566 4650 634e 3231 2070 6275 6d70 5f5f 3973
2544360  7472 6561 6d62 7566 4669 205c 0067 6275 6d70 5f5f 3973 7472 6561 6d62 7566 4669 2073 6574 625f 5f39 7374 7265 616d 6275
2544440  6646 5063 5431 6920 756e 6275 6666 6572 6564 5f5f 3973 7472 6561 6d62 7566 4676 2075 6e62 7566 6665 7265 645f 5f39 7374
2544520  7265 616d 6275 6646 6920 616c 6c6f 6361 7465 5f5f 3973 7472 6561 6d62 7566 4676 2064 6f61 6c6c 6f63 6174 655f 5f39 7374
2544600  7265 616d 6275 6646 7620 6f76 6572 666c 6f77 5f5f 3973 7472 6561 6d62 7566 4669 2075 6e64 6572 666c 6f77 5f5f 3973 7472
2544660  6561 6d62 7566 4676 205c 0070 6261 636b 6661 696c 5f5f 3973 7472 6561 6d62 7566 4669 2073 796e 635f 5f39 7374 7265 616d
2544740  6275 6646 7620 7365 656b 6f66 665f 5f39 7374 7265 616d 6275 6646 6c38 7365 656b 5f64 6972 6920 7365 656b 706f 735f 5f39
2545020  7374 7265 616d 6275 6646 6c69 2078 7370 7574 6e5f 5f39 7374 7265 616d 6275 6646 5043 6369 2078 7367 6574 6e5f 5f39 7374
2545100  7265 616d 6275 6646 5063 6920 696e 5f61 7661 696c 5f5f 3973 7472 6561 6d62 7566 4676 206f 7574 5f77 6169 7469 6e67 5f5f
2545160  3973 7472 6561 6d62 7566 4676 205c 0073 6765 7463 5f5f 3973 7472 6561 6d62 7566 4676 2073 6e65 7874 635f 5f39 7374 7265
2545240  616d 6275 6646 7620 7362 756d 7063 5f5f 3973 7472 6561 6d62 7566 4676 2073 746f 7373 635f 5f39 7374 7265 616d 6275 6646
2545320  7620 7370 7574 6261 636b 635f 5f39 7374 7265 616d 6275 6646 6320 7370 7574 635f 5f39 7374 7265 616d 6275 6646 6920 7370
2545400  7574 6e5f 5f39 7374 7265 616d 6275 6646 5043 6369 2073 6765 746e 5f5f 3973 7472 6561 6d62 7566 4650 6369 2073 6574 6275
2545460  665f 5f39 7374 7265 616d 6275 6646 5063 6920 5c00 7365 7462 7566 5f5f 3973 7472 6561 6d62 7566 4650 5563 6920 7365 7462
2545540  7566 5f5f 3973 7472 6561 6d62 7566 4650 6369 5432 205f 5f64 745f 5f39 7374 7265 616d 6275 6646 7620 785f 736e 6578 7463
```

```
2545620 5f5f 3973 7472 6561 6d62 7566 4676 203b 3b3b 0069 7374 7265 616d 3a54 2830 2c33 3229 3d73 3732 785f 6763 6f75 6e74 5f5f
2545700 3769 7374 7265 616d 3a28 302c 3129 2c30 2c33 323b 5f5f 7670 7472 5f5f 3769 7374 7265 616d 3a28 302c 3330 292c 3332 2c33
2545760 323b 5069 6f73 3a28 302c 3333 293d 2a28 302c 3233 292c 3634 2c33 323b 4f69 6f73 3a28 302c 3233 292c 3936 2c34 3830 3b3b
2546040 0069 7374 7265 616d 3a5a 6369 7374 7265 616d 3b69 6f73 3b5f 5f63 745f 5f37 6973 7472 6561 6d46 5039 7374 7265 616d 6275
2546120 6620 5f5f 6374 5f5f 3769 7374 7265 616d 4676 205f 5f63 745f 5f37 6973 7472 6561 6d46 5039 7374 7265 616d 6275 6669 5037
2546200 6f73 7472 6561 6d20 5f5f 6374 5f5f 3769 7374 7265 616d 4669 5063 5431 205f 5f63 745f 5f37 6973 7472 6561 6d46 6954 3150
2546260 376f 7374 7265 616d 205f 5f63 745f 5f37 6973 7472 6561 6d46 5237 6973 7472 6561 6d20 5f5f 6474 5f5f 3769 7374 7265 616d
2546340 4676 205c 0069 7066 785f 5f37 6973 7472 6561 6d46 6920 6973 6678 5f5f 3769 7374 7265 616d 4676 2073 6565 6b67 5f5f 3769
2546420 7374 7265 616d 466c 2073 6565 6b67 5f5f 3769 7374 7265 616d 466c 3873 6565 6b5f 6469 7220 7465 6c6c 675f 5f37 6973 7472
2546500 6561 6d46 7620 5f5f 7273 5f5f 3769 7374 7265 616d 4650 4652 3769 7374 7265 616d 5f52 3769 7374 7265 616d 205f 5f72 735f
2546560 5f37 6973 7472 6561 6d46 5046 5233 696f 735f 5233 696f 7320 5f5f 7273 5f5f 3769 7374 7265 616d 4650 6320 5f5f 7273 5f5f
2546640 3769 7374 7265 616d 4650 5563 205c 005f 5f72 735f 5f37 6973 7472 6561 6d46 5255 6320 5f5f 7273 5f5f 3769 7374 7265 616d
2546720 4652 6320 5f5f 7273 5f5f 3769 7374 7265 616d 4652 7320 5f5f 7273 5f5f 3769 7374 7265 616d 4652 6920 5f5f 7273 5f5f 3769
2547000 7374 7265 616d 4652 6c20 5f5f 7273 5f5f 3769 7374 7265 616d 4652 5573 205f 5f72 735f 5f37 6973 7472 6561 6d46 5255 6920
2547060 5f5f 7273 5f5f 3769 7374 7265 616d 4652 556c 205f 5f72 735f 5f37 6973 7472 6561 6d46 5266 205f 5f72 735f 5f37 6973 7472
2547140 6561 6d46 5264 205f 5f72 735f 5f37 6973 7472 6561 6d46 5039 7374 7265 616d 6275 6620 5c00 6765 745f 5f37 6973 7472 6561
2547220 6d46 5063 6963 2067 6574 5f5f 3769 7374 7265 616d 4650 5563 6963 2067 6574 5f5f 3769 7374 7265 616d 4652 3973 7472 6561
2547300 6d62 7566 6320 6765 745f 5f37 6973 7472 6561 6d46 5255 6320 6765 745f 5f37 6973 7472 6561 6d46 5263 2067 6574 5f5f 3769
2547360 7374 7265 616d 4676 2067 6574 6c69 6e65 5f5f 3769 7374 7265 616d 4650 6369 6320 6765 746c 696e 655f 5f37 6973 7472 6561
2547440 6d46 5055 6369 6320 7065 656b 5f5f 3769 7374 7265 616d 4676 2069 676e 6f72 655f 5f37 6973 7472 6561 6d46 6954 3120 5c00
2547520 7265 6164 5f5f 3769 7374 7265 616d 4650 6369 2072 6561 645f 5f37 6973 7472 6561 6d46 5055 6369 2067 636f 756e 745f 5f37
2547600 6973 7472 6561 6d46 7620 7075 7462 6163 6b5f 5f37 6973 7472 6561 6d46 6320 7379 6e63 5f5f 3769 7374 7265 616d 4676 2064
2547660 6f5f 6970 6678 5f5f 3769 7374 7265 616d 4669 2065 6174 7768 6974 655f 5f37 6973 7472 6561 6d46 7620 7867 6574 5f5f 3769
2547740 7374 7265 616d 4650 6320 3b3b 3b00 6f73 7472 6561 6d3a 5428 302c 3236 293d 7336 385f 5f76 7074 725f 5f37 6f73 7472 6561
2550020 6d3a 2830 2c33 3029 2c30 2c33 323b 5069 6f73 3a28 302c 3333 292c 3332 2c33 323b 4f69 6f73 3a28 302c 3233 292c 3634 2c34
2550100 3830 3b3b 006f 7374 7265 616d 3a5a 636f 7374 7265 616d 3b69 6f73 3b5f 5f63 745f 5f37 6f73 7472 6561 6d46 5039 7374 7265
2550160 616d 6275 6620 5f5f 6374 5f5f 376f 7374 7265 616d 4676 205f 5f63 745f 5f37 6f73 7472 6561 6d46 6920 5f5f 6374 5f5f 376f
2550240 7374 7265 616d 4669 5063 205f 5f63 745f 5f37 6f73 7472 6561 6d46 5237 6f73 7472 6561 6d20 5f5f 6474 5f5f 376f 7374 7265
2550320 616d 4676 206f 7066 785f 5f37 6f73 7472 6561 6d46 7620 6f73 6678 5f5f 376f 7374 7265 616d 4676 2066 6c75 7368 5f5f 376f
2550400 7374 7265 616d 4676 205c 0073 6565 6b70 5f5f 376f 7374 7265 616d 466c 2073 6565 6b70 5f5f 376f 7374 7265 616d 466c 3873
2550460 6565 6b5f 6469 7220 7465 6c6c 705f 5f37 6f73 7472 6561 6d46 7620 7075 745f 5f37 6f73 7472 6561 6d46 6320 5f5f 6c73 5f5f
2550540 376f 7374 7265 616d 4663 205f 5f6c 735f 5f37 6f73 7472 6561 6d46 5563 205f 5f6c 735f 5f37 6f73 7472 6561 6d46 5043 6320
2550620 5f5f 6c73 5f5f 376f 7374 7265 616d 4669 205f 5f6c 735f 5f37 6f73 7472 6561 6d46 6c20 5f5f 6c73 5f5f 376f 7374 7265 616d
2550700 4664 205f 5f6c 735f 5f37 6f73 7472 6561 6d46 6620 5c00 5f5f 6c73 5f5f 376f 7374 7265 616d 4655 6920 5f5f 6c73 5f5f 376f
2550760 7374 7265 616d 4655 6c20 5f5f 6c73 5f5f 376f 7374 7265 616d 4650 7620 5f5f 6c73 5f5f 376f 7374 7265 616d 4650 3973 7472
2551040 6561 6d62 7566 205f 5f6c 735f 5f37 6f73 7472 6561 6d46 7320 5f5f 6c73 5f5f 376f 7374 7265 616d 4655 7320 5f5f 6c73 5f5f
2551120 376f 7374 7265 616d 4650 4652 376f 7374 7265 616d 5f52 376f 7374 7265 616d 205f 5f6c 735f 5f37 6f73 7472 6561 6d46 5046
2551200 5233 696f 735f 5233 696f 7320 7772 6974 655f 5f37 6f73 7472 6561 6d46 5043 6369 205c 0077 7269 7465 5f5f 376f 7374 7265
2551260 616d 4650 4355 6369 2064 6f5f 6f70 6678 5f5f 376f 7374 7265 616d 4676 2064 6f5f 6f73 6678 5f5f 376f 7374 7265 616d 4676
2551340 203b 3b3b 0070 7574 5f5f 376f 7374 7265 616d 4663 3a66 2830 2c33 3429 3d2a 2830 2c32 3629 005f 5f30 7468 6973 3a70 2830
2551420 2c33 3429 005f 5f30 633a 7028 302c 3229 002f 7573 722f 4343 2f73 756e 342f 696e 636c 2f69 6f73 7472 6561 6d2e 6800 5f5f
2551500 3074 6869 733a 7229 302c 3334 2900 5f5f 3074 6869 7320 3a5a 746c 005f 5f30 6320 3a5a 746c 0070 7574 5f5f 376f 7374 7265
2551560 616d 4663 203a 5a74 4600 696f 7374 7265 616d 3a54 2830 2c33 3529 3d73 3830 785f 6763 6f75 6e74 5f5f 3769 7374 7265 616d
2551640 3a28 302c 3129 2c30 2c33 323b 5f5f 7670 7472 5f5f 3769 7374 7265 616d 3a28 302c 3330 292c 3332 2c33 323b 5069 6f73 3a28
2551720 302c 3333 292c 3634 2c33 323b 4f6f 7374 7265 616d 3a28 302c 3236 292c 3936 2c35 3434 3b3b 0069 6f73 7472 6561 6d3a 5a63
2552000 696f 7374 7265 616d 3b69 7374 7265 616d 206f 7374 7265 616d 2069 6f73 3b5f 5f63 745f 5f38 696f 7374 7265 616d 4650 3973
2552060 7472 6561 6d62 7566 205f 5f63 745f 5f38 696f 7374 7265 616d 4676 205f 5f63 745f 5f38 696f 7374 7265 616d 4652 3869 6f73
2552140 7472 6561 6d20 5f5f 6474 5f5f 3869 6f73 7472 6561 6d46 7620 3b3b 3b00 6369 6e3a 4728 302c 3336 293d 7873 6973 7472 6561
2552220 6d5f 7769 7468 6173 7369 676e 3a00 636f 7574 3a47 2830 2c33 3729 3d78 736f 7374 7265 616d 5f77 6974 6861 7373 6967 6e3a
2552300 0063 6572 723a 4728 302c 3337 2900 636c 6f67 3a47 2830 2c33 3729 0049 6f73 7472 6561 6d5f 696e 6974 3a54 2830 2c33 3829
2552360 3d73 315f 5f57 395f 5f31 3349 6f73 7472 6561 6d5f 696e 6974 3a28 302c 3229 2c30 2c38 3b3b 0073 7464 7374 6174 7573 5f5f
2552440 3133 496f 7374 7265 616d 5f69 6e69 743a 4728 302c 3129 0069 6e69 7463 6f75 6e74 5f5f 3133 496f 7374 7265 616d 5f69 6e69
2552520 743a 4728 302c 3129 0049 6f73 7472 6561 6d5f 696e 6974 3a5a 6349 6f73 7472 6561 6d5f 696e 6974 3b3b 5f5f 6374 5f5f 3133
2552600 496f 7374 7265 616d 5f69 6e69 7446 7620 5f5f 6474 5f5f 3133 496f 7374 7265 616d 5f69 6e69 7446 7620 3b73 7464 7374 6174
2552660 7573 5f5f 3133 496f 7374 7265 616d 5f69 6e69 7420 696e 6974 636f 756e 745f 5f31 3349 6f73 7472 6561 6d5f 696e 6974 203b
```

| | | | | | | | | | | | | | | | | | | | | | | | | |
|---|---|---|---|---|---|---|---|---|---|---|---|---|---|---|---|---|---|---|---|---|---|---|---|---|
| 2552740 | 4069 | 6f73 | 3b00 | 696f | 7374 | 7265 | 616d | 5f69 | 6e69 | 743a | 5328 | 302c | 3338 | 2900 | 4750 | 543a | 7428 | 302c | 3133 | 2900 | 736d | 616e | 6970 | 5f69 |
| 2553020 | 6e74 | 3a54 | 2830 | 2c33 | 3929 | 3d73 | 3866 | 6374 | 5f5f | 3130 | 736d | 616e | 6970 | 5f69 | 6e74 | 3a28 | 302c | 3430 | 293d | 2a28 | 302c | 3431 | 293d | 6628 |
| 2553100 | 302c | 3333 | 292c | 302c | 3332 | 3b61 | 7267 | 5f5f | 3130 | 736d | 616e | 6970 | 5f69 | 6e74 | 3a28 | 302c | 3129 | 2c33 | 322c | 3332 | 3b3b | 0073 | 6d61 | 6e69 |
| 2553160 | 705f | 696e | 743a | 5a63 | 736d | 616e | 6970 | 5f69 | 6e74 | 3b3b | 5f5f | 6374 | 5f5f | 3130 | 736d | 616e | 6970 | 5f69 | 6e74 | 4650 | 4652 | 3369 | 6f73 | 695f |
| 2553240 | 5233 | 696f | 7369 | 203b | 3b5f | 5f6c | 735f | 5f46 | 5237 | 6f73 | 7472 | 6561 | 6d52 | 3130 | 736d | 616e | 6970 | 5f69 | 6e74 | 205f | 5f72 | 735f | 5f46 | 5237 |
| 2553320 | 6973 | 7472 | 6561 | 6152 | 3130 | 736d | 616e | 6970 | 5f69 | 6e74 | 203b | 0073 | 6170 | 706c | 795f | 696e | 743a | 5428 | 302c | 3432 | 293d | 7334 | 6663 | 745f |
| 2553400 | 5f31 | 3073 | 6170 | 706c | 795f | 696e | 743a | 2830 | 2c34 | 3029 | 2c30 | 2c33 | 323b | 3b00 | 7361 | 7070 | 6c79 | 5f69 | 6e74 | 3a5a | 6373 | 6170 | 706c | 795f |
| 2553460 | 696e | 743b | 3b5f | 5f63 | 745f | 5f31 | 3073 | 6170 | 706c | 795f | 696e | 7446 | 5046 | 5233 | 696f | 7369 | 5f52 | 3369 | 6f73 | 205f | 5f63 | 6c5f | 5f31 | 3073 |
| 2553540 | 6170 | 706c | 795f | 696e | 7446 | 6920 | 3b3b | 3b00 | 696d | 616e | 6970 | 5f69 | 6e74 | 3a54 | 2830 | 2c34 | 3329 | 3d73 | 3866 | 6374 | 5f5f | 3130 | 696d | 616e |
| 2553620 | 6970 | 5f69 | 6e74 | 3a28 | 302c | 3434 | 293d | 2a28 | 302c | 3435 | 293d | 6628 | 302c | 3436 | 293d | 2a28 | 302c | 3332 | 292c | 302c | 3332 | 3b61 | 7267 | 5f5f |
| 2553700 | 3130 | 696d | 616e | 6970 | 5f69 | 6e74 | 3a28 | 302c | 3129 | 2c33 | 322c | 3332 | 3b3b | 0069 | 6d61 | 6e69 | 705f | 696e | 743a | 5a63 | 696d | 616e | 6970 | 5f69 |
| 2553760 | 6e74 | 3b3b | 5f5f | 6374 | 5f5f | 3130 | 696d | 616e | 6970 | 5f69 | 6e74 | 4650 | 4652 | 3769 | 7374 | 7265 | 616d | 695f | 5237 | 6973 | 7472 | 6561 | 6d69 | 203b |
| 2554040 | 3b5f | 5f72 | 735f | 5f46 | 5237 | 6973 | 7472 | 6561 | 6d52 | 3130 | 696d | 616e | 6970 | 5f69 | 6e74 | 203b | 0069 | 6170 | 706c | 795f | 696e | 743a | 5428 | 302c |
| 2554120 | 3437 | 293d | 7334 | 6663 | 745f | 5f31 | 3069 | 6170 | 706c | 795f | 696e | 743a | 2830 | 2c34 | 3429 | 2c30 | 2c33 | 323b | 3b00 | 6961 | 7070 | 6c79 | 5f69 | 6e74 |
| 2554200 | 3a5a | 6369 | 6170 | 706c | 795f | 696e | 743b | 3b5f | 5f63 | 745f | 5f31 | 3069 | 6170 | 706c | 795f | 696e | 7446 | 5046 | 5237 | 6973 | 7472 | 6561 | 6d69 | 5f52 |
| 2554260 | 3769 | 7374 | 7265 | 616d | 205f | 5f63 | 6c5f | 5f31 | 3069 | 6170 | 706c | 795f | 696e | 7446 | 6920 | 3b3b | 3b00 | 6f6d | 616e | 6970 | 5f69 | 6e74 | 3a54 | 2830 |
| 2554340 | 2c34 | 3929 | 3d73 | 3866 | 6374 | 5f5f | 3130 | 6f6d | 616e | 6970 | 5f69 | 6e74 | 3a28 | 302c | 3439 | 293d | 2a28 | 302c | 3530 | 293d | 6628 | 302c | 3334 | 292c |
| 2554420 | 302c | 3332 | 3b61 | 7267 | 5f5f | 3130 | 6f6d | 616e | 6970 | 5f69 | 6e74 | 3a28 | 302c | 3129 | 2c33 | 322c | 3332 | 3b3b | 006f | 6d61 | 6e69 | 705f | 696e | 743a |
| 2554500 | 5a63 | 6f6d | 616e | 6970 | 5f69 | 6e74 | 3b3b | 5f5f | 6374 | 5f5f | 3130 | 6f6d | 616e | 6970 | 5f69 | 6e74 | 4650 | 4652 | 376f | 7374 | 7265 | 616d | 695f | 5237 |
| 2554560 | 6f73 | 7472 | 6561 | 6169 | 203b | 3b5f | 5f6c | 735f | 5f46 | 5237 | 6f73 | 7472 | 6561 | 6d52 | 3130 | 6f6d | 616e | 6970 | 5f69 | 6e74 | 203b | 006f | 6170 | 706c |
| 2554640 | 795f | 696e | 743a | 5428 | 302c | 3531 | 293d | 7334 | 6663 | 745f | 5f31 | 306f | 6170 | 706c | 795f | 696e | 743a | 2830 | 2c34 | 3929 | 2c30 | 2c33 | 323b | 3b00 |
| 2554720 | 6f61 | 7070 | 6c79 | 5f69 | 6e74 | 3a5a | 636f | 6170 | 706c | 795f | 696e | 743b | 3b5f | 5f63 | 745f | 5f31 | 306f | 6170 | 706c | 795f | 696e | 7446 | 5046 | 5237 |
| 2555000 | 6f73 | 7472 | 6561 | 6d69 | 5f52 | 376f | 7374 | 7265 | 616d | 205f | 5f63 | 6c5f | 5f31 | 306f | 6170 | 706c | 795f | 696e | 7446 | 6920 | 3b3b | 3b00 | 696f | 6d61 |
| 2555060 | 6e69 | 705f | 696e | 743a | 5428 | 302c | 3532 | 293d | 7338 | 6663 | 745f | 5f31 | 3169 | 6f6d | 616e | 6970 | 5f69 | 6e74 | 3a28 | 302c | 3533 | 293d | 2a28 | 302c |
| 2555140 | 3534 | 293d | 6628 | 302c | 3535 | 293d | 2a28 | 302c | 3335 | 292c | 302c | 3332 | 3b61 | 7267 | 5f5f | 3131 | 696f | 6d61 | 6e69 | 705f | 696e | 743a | 2830 | 2c31 |
| 2555220 | 292c | 3332 | 2c33 | 323b | 3b00 | 696f | 6d61 | 6e69 | 705f | 696e | 743a | 5a63 | 696f | 6d61 | 6e69 | 705f | 696e | 743b | 3b5f | 5f63 | 745f | 5f31 | 3169 | 6f6d |
| 2555300 | 616e | 6970 | 5f69 | 6e74 | 4650 | 4652 | 3869 | 6f73 | 7472 | 6561 | 6d69 | 5f52 | 3869 | 6f73 | 7472 | 6561 | 6d69 | 203b | 3b5f | 5f6c | 735f | 5f46 | 5238 | 696f |
| 2555360 | 7374 | 7265 | 616d | 5231 | 3169 | 6f6d | 616e | 6970 | 5f69 | 6e74 | 205f | 5f72 | 735f | 5f46 | 5238 | 696f | 7374 | 7265 | 616d | 5231 | 3169 | 6f6d | 616e | 6970 |
| 2555440 | 5f69 | 6e74 | 203b | 0069 | 6f61 | 7070 | 6c79 | 5f69 | 6e74 | 3a54 | 2830 | 2c35 | 3629 | 3d73 | 3466 | 6374 | 5f5f | 3131 | 696f | 6170 | 706c | 795f | 696e | 743a |
| 2555520 | 2830 | 2c35 | 3329 | 2c30 | 2c33 | 323b | 3b00 | 696f | 6170 | 706c | 795f | 696e | 743a | 5a63 | 696f | 6170 | 706c | 795f | 696e | 743b | 3b5f | 5f63 | 745f | 5f31 |
| 2555600 | 3169 | 6f61 | 7070 | 6c79 | 5f69 | 6e74 | 4650 | 4652 | 3869 | 6f73 | 7472 | 6561 | 6d69 | 5f52 | 3869 | 6f73 | 7472 | 6561 | 6d20 | 5f5f | 636c | 5f5f | 3131 | 696f |
| 2555660 | 6170 | 706c | 795f | 696e | 7446 | 6920 | 3b3b | 3b00 | 736d | 616e | 6970 | 5f6c | 6f6e | 673a | 5428 | 302c | 3537 | 293d | 7338 | 6663 | 745f | 5f31 | 3173 | 6d61 |
| 2555740 | 6e69 | 705f | 6c6f | 6e67 | 3a28 | 302c | 3430 | 292c | 302c | 3332 | 3b61 | 7267 | 5f5f | 3131 | 736d | 616e | 6970 | 5f6c | 6f6e | 673a | 2830 | 2c31 | 292c | 3332 |
| 2556020 | 2c33 | 323b | 3b00 | 736d | 616e | 6970 | 5f6c | 6f6e | 673a | 5a63 | 736d | 616e | 6970 | 5f6c | 6f6e | 673b | 3b5f | 5f63 | 745f | 5f31 | 3173 | 6d61 | 6e69 | 705f |
| 2556100 | 6c6f | 6e67 | 4650 | 4652 | 3369 | 6f73 | 6c5f | 5233 | 696f | 736c | 203b | 3b5f | 5f6c | 735f | 5f46 | 5237 | 6f73 | 7472 | 6561 | 6d52 | 3131 | 736d | 616e | 6970 |
| 2556160 | 5f6c | 6f6e | 6720 | 5f5f | 7273 | 5f5f | 4652 | 3769 | 7374 | 7265 | 616d | 5231 | 3173 | 6d61 | 6e69 | 705f | 6c6f | 6e67 | 203b | 0073 | 6170 | 706c | 795f | 6c6f |
| 2556240 | 6e67 | 3a54 | 2830 | 2c35 | 3829 | 3d73 | 3466 | 6374 | 5f5f | 3131 | 7361 | 7070 | 6c79 | 5f6c | 6f6e | 673a | 2830 | 2c34 | 3029 | 2c30 | 2c33 | 323b | 3b00 | 7361 |
| 2556320 | 7070 | 6c79 | 5f6c | 6f6e | 673a | 5a63 | 7361 | 7070 | 6c79 | 5f6c | 6f6e | 673b | 3b5f | 5f63 | 745f | 5f31 | 3173 | 6170 | 706c | 795f | 6c6f | 6e67 | 4650 | 4652 |
| 2556400 | 3369 | 6f73 | 6c5f | 5233 | 696f | 7320 | 5f5f | 636c | 5f5f | 3131 | 7361 | 7070 | 6c79 | 5f6c | 6f6e | 6746 | 6c20 | 3b3b | 3b00 | 696d | 616e | 6970 | 5f6c | 6f6e |
| 2556460 | 673a | 5428 | 302c | 3539 | 293d | 7338 | 6663 | 745f | 5f31 | 3169 | 6d61 | 6e69 | 705f | 6c6f | 6e67 | 3a28 | 302c | 3434 | 292c | 302c | 3332 | 3b61 | 7267 | 5f5f |
| 2556540 | 3131 | 696d | 616e | 6970 | 5f6c | 6f6e | 673a | 2830 | 2c31 | 292c | 3332 | 2c33 | 323b | 3b00 | 696d | 616e | 6970 | 5f6c | 6f6e | 673a | 5a63 | 696d | 616e | 6970 |
| 2556620 | 5f6c | 6f6e | 673b | 3b5f | 5f63 | 745f | 5f31 | 3169 | 6d61 | 6e69 | 705f | 6c6f | 6e67 | 4650 | 4652 | 3769 | 7374 | 7265 | 616d | 6c5f | 5237 | 6973 | 7472 | 6561 |
| 2556700 | 6d6c | 203b | 3b5f | 5f72 | 735f | 5f46 | 5237 | 6973 | 7472 | 6561 | 6d52 | 3131 | 696d | 616e | 6970 | 5f6c | 6f6e | 6720 | 3b00 | 6961 | 7070 | 6c79 | 5f6c | 6f6e |
| 2556760 | 673a | 5428 | 302c | 3630 | 293d | 7334 | 6663 | 745f | 5f31 | 3169 | 6170 | 706c | 795f | 6c6f | 6e67 | 3a28 | 302c | 3434 | 292c | 302c | 3332 | 3b3b | 0069 | 6170 |
| 2557040 | 706c | 795f | 6c6f | 6e67 | 3a5a | 6369 | 6170 | 706c | 795f | 6c6f | 6e67 | 3b3b | 5f5f | 6374 | 5f5f | 3131 | 6961 | 7070 | 6c79 | 5f6c | 6f6e | 6746 | 5046 | 5237 |
| 2557120 | 6973 | 7472 | 6561 | 616c | 5f52 | 3769 | 7374 | 7265 | 6164 | 205f | 5f63 | 6c5f | 5f31 | 3169 | 6170 | 706c | 795f | 6c6f | 6e67 | 466c | 203b | 3b3b | 006f | 6d61 |
| 2557200 | 6e69 | 705f | 6c6f | 6e67 | 3a54 | 2830 | 2c36 | 3129 | 3d73 | 3866 | 6374 | 5f5f | 3131 | 6f6d | 616e | 6970 | 5f6c | 6f6e | 673a | 2830 | 2c34 | 3929 | 2c30 | 2c33 |
| 2557260 | 323b | 6172 | 675f | 5f31 | 316f | 6d61 | 6e69 | 705f | 6c6f | 6e67 | 3a28 | 302c | 3129 | 2c33 | 322c | 3332 | 3b3b | 006f | 6d61 | 6e69 | 705f | 6c6f | 6e67 | 3a5a |
| 2557340 | 636f | 6d61 | 6e69 | 705f | 6c6f | 6e67 | 3b3b | 5f5f | 6374 | 5f5f | 3131 | 6f6d | 616e | 6970 | 5f6c | 6f6e | 6746 | 5046 | 5237 | 6f73 | 7472 | 6561 | 6d6c | 5f52 |
| 2557420 | 376f | 7374 | 7265 | 616d | 6c20 | 3b3b | 5f5f | 6c73 | 5f5f | 4652 | 376f | 7374 | 7265 | 616d | 5231 | 316f | 6d61 | 6e69 | 705f | 6c6f | 6e67 | 203b | 006f | 6170 |
| 2557500 | 706c | 795f | 6c6f | 6e67 | 3a54 | 2830 | 2c36 | 3229 | 3d73 | 3466 | 6374 | 5f5f | 3131 | 6f61 | 7070 | 6c79 | 5f6c | 6f6e | 673a | 2830 | 2c34 | 3929 | 2c30 | 2c33 |
| 2557560 | 323b | 3b00 | 6f61 | 7070 | 6c79 | 5f6c | 6f6e | 673a | 5a63 | 6f61 | 7070 | 6c79 | 5f6c | 6f6e | 673b | 3b5f | 5f63 | 745f | 5f31 | 316f | 6170 | 706c | 795f | 6c6f |
| 2557640 | 6e67 | 4650 | 4652 | 376f | 7374 | 7265 | 616d | 6c5f | 5237 | 6f73 | 7472 | 6561 | 6d20 | 5f5f | 636c | 5f5f | 3131 | 6f61 | 7070 | 6c79 | 5f6c | 6f6e | 6746 | 6c20 |
| 2557720 | 3b3b | 3b00 | 696f | 6161 | 6e69 | 705f | 6c6f | 6e67 | 3a54 | 2930 | 2c36 | 3329 | 3d73 | 3866 | 6374 | 5f5f | 3132 | 696f | 6d61 | 6e69 | 705f | 6c6f | 6e67 | 3a28 |
| 2560000 | 302c | 3533 | 292c | 302c | 3332 | 3b61 | 7267 | 5f5f | 3132 | 696f | 6d61 | 6e69 | 705f | 6c6f | 6e67 | 3a28 | 302c | 3129 | 2c33 | 322c | 3332 | 3b3b | 0069 | 6f6d |

```
2560060  616e 6970 5f6c 6f6e 673a 5a63 696f 6d61 6e69 705f 6c6f 6e67 3b3b 5f5f 6374 5f5f 3132 696f 6d61 6e69 705f 6c6f 6e67 4650
2560140  4652 3869 6f73 7472 6561 6d6c 5f52 3869 6f73 7472 6561 6d6c 203b 3b5f 5f6c 735f 5f46 5239 696f 7374 7265 616d 5231 3269
2560220  6f6d 616e 6970 5f6c 6f6e 6720 5f5f 7273 5f5f 4652 3869 6f73 7472 6561 6d52 3132 696f 6d61 6e69 705f 6c6f 6e67 203b 0069
2560300  6f61 7070 6c79 5f6c 6f6e 673a 5428 302c 3634 293d 7334 6663 745f 5f31 3269 6f61 7070 6c79 5f6c 6f6e 673a 2830 2c35 3329
2560360  2c30 2c33 323b 3b00 696f 6170 706c 795f 6c6f 6e67 3a5a 6369 6f61 7070 6c79 5f6c 6f6e 673b 3b5f 5f63 745f 5f31 3269 6f61
2560440  7070 6c79 5f6c 6f6e 6746 5046 5238 696f 7374 7265 616d 6c5f 5238 696f 7374 7265 616d 205f 5f63 6c5f 5f31 3269 6f61 7070
2560520  6c79 5f6c 6f6e 6746 6c20 3b3b 3b00 6572 726e 6f3a 4728 302c 3129 0073 7973 5f6e 6572 723a 4728 302c 3129 0073 7464 696f
2560600  6275 663a 5428 302c 3636 293d 7335 3261 6c6c 6f63 5f5f 3973 7472 6561 6d62 7566 3a28 302c 3429 2c30 2c31 363b 785f 756e
2560660  6275 665f 5f39 7374 7265 616d 6275 663a 2830 2c34 292c 3136 2c31 363b 785f 6261 7365 5f5f 3973 7472 6561 6d62 7566 3a28
2560740  302c 3331 292c 3332 2c33 323b 785f 7062 6173 655f 5f39 7374 7265 6161 6275 663a 2830 2c33 3129 2c36 342c 3332 3b78 5f70
2561020  7074 725f 5f39 7374 7265 616d 6275 663a 2830 2c33 3129 2c39 362c 3332 3b78 5f65 7070 7472 5f5f 3973 7472 6561 6d62 7566
2561100  3a28 302c 3331 292c 3132 382c 3332 3b78 5f67 7074 725f 5f39 7374 7265 616d 6275 663a 2830 2c33 3129 2c31 3630 2c33 323b
2561160  785f 6567 7074 725f 5f39 7374 7265 616d 6275 663a 2830 2c33 3129 2c31 3932 2c33 323b 5c00 785f 6562 6163 6b5f 5f39 7374
2561240  7265 616d 6275 663a 2830 2c33 3129 2c32 3234 2c33 323b 785f 626c 656e 5f5f 3973 7472 6561 6d62 7566 3a28 302c 3129 2c32
2561320  3536 2c33 323b 5f5f 7670 7472 5f5f 3973 7472 6561 6d62 7566 3a28 302c 3330 292c 3238 382c 3332 3b66 705f 5f38 7374 6469
2561400  6f62 7566 3a28 302c 3637 293d 2a28 302c 3635 293d 7873 5f69 6f62 7566 3a2c 3332 302c 3332 3b6c 6173 745f 6f70 5f5f 3873
2561460  7464 696f 6275 663a 2830 2c31 292c 3335 322c 3332 3b62 7566 5f5f 3873 7464 696f 6275 663a 2830 2c36 3829 3d61 7228 302c
2561540  3129 3b30 3b31 3b28 302c 3229 2c33 3034 2c31 363b 3b00 7374 6469 6f62 7566 3a5a 6373 7464 696f 6275 663b 7374 7265 616d
2561620  6275 663b 6f76 6572 666c 6f77 5f5f 3873 7464 696f 6275 6646 6920 756e 6465 7266 6c6f 775f 5f38 7374 6469 6f62 7566 4676
2561700  2073 796e 635f 5f38 7374 6469 6f62 7566 4676 2073 6565 6b6f 6666 5f5f 3873 7464 696f 6275 6646 6c38 7365 656b 5f64 6972
2561760  6920 7062 6163 6b66 6169 6c5f 5f38 7374 6469 6f62 7566 4669 205f 5f63 745f 5f38 7374 6469 6f62 7566 4650 365f 696f 6275
2562040  6620 5f5f 6374 5f5f 3873 7464 696f 6275 6646 5243 3873 7464 696f 6275 6620 5c00 7374 6469 6f66 696c 655f 5f38 7374 6469
2562120  6f62 7566 4676 235f 5f64 745f 5f38 7374 6469 6f62 7566 4676 203b 3b3b 0066 696c 6562 7566 3a54 2830 2c36 3929 3d73 3634
2562200  616c 6c6f 635f 5f39 7374 7265 616d 6275 663a 2830 2c34 292c 302c 3136 3b78 5f75 6e62 7566 5f5f 3973 7472 6561 6d62 7566
2562260  3a28 302c 3429 2c31 362c 3136 3b78 5f62 6173 655f 5f39 7374 7265 616d 6275 663a 2830 2c33 3129 2c33 322c 3332 3b78 5f70
2562340  6261 7365 5f5f 3973 7472 6561 6d62 7566 3a28 302c 3331 292c 3634 2c33 323b 785f 7070 7472 5f5f 3973 7472 6561 6d62 7566
2562420  3a28 302c 3331 292c 3936 2c33 323b 785f 6570 7074 725f 5f39 7374 7265 616d 6275 663a 2830 2c33 3129 2c31 3238 2c33 323b
2562500  785f 6770 7472 5f5f 3973 7472 6561 6d62 7566 3a28 302c 3331 292c 3136 302c 3332 3b78 5f65 6770 7472 5f5f 3973 7472 6561
2562560  6d62 7566 3a28 302c 3331 292c 3139 322c 3332 3b5c 0078 5f65 6261 636b 5f5f 3973 7472 6561 6d62 7566 3a28 302c 3331 292c
2562640  3232 342c 3332 3b78 5f62 6c65 6e5f 5f39 7374 7265 616d 6275 663a 2830 2c31 292c 3235 362c 3332 3b5f 5f76 7074 725f 5f39
2562720  7374 7265 616d 6275 663a 2830 2c33 3029 2c32 3838 2c33 323b 7866 645f 5f37 6669 6c65 6275 663a 2830 2c31 292c 3332 302c
2563000  3332 3b6d 6f64 655f 5f37 6669 6c65 6275 663a 2830 2c31 292c 3335 322c 3332 3b6f 7065 6e65 645f 5f37 6669 6c65 6275 663a
2563060  2830 2c32 292c 3338 342c 383b 6c61 7374 5f73 6565 6b5f 5f37 6669 6c65 6275 663a 2830 2c31 292c 3431 362c 3332 3b69 6e5f
2563140  7374 6172 745f 5f37 6669 6c65 6275 663a 2830 2c33 3129 2c34 3438 2c33 323b 6c61 6865 6164 5f5f 3766 696c 6562 7566 3a28
2563220  302c 3638 292c 3438 302c 3136 3b3b 006f 7065 6e70 726f 745f 5f37 6669 6c65 6275 663a 4728 302c 3129 0066 696c 6562 7566
2563300  3a5a 6366 696c 6562 7566 3b73 7472 6561 6d62 7566 3b5f 5f63 745f 5f37 6669 6c65 6275 6646 7620 5f5f 6374 5f5f 3766 696c
2563360  6562 7566 4669 205f 5f63 745f 5f37 6669 6c65 6275 6646 6950 6354 3120 5f5f 6374 5f5f 3766 696c 6562 7566 4652 4337 6669
2563440  6c65 6275 6620 6973 5f6f 7065 6e5f 5f37 6669 6c65 6275 6646 7620 6664 5f5f 3766 696c 6562 7566 4676 206f 7065 6e5f 5f37
2563520  6669 6c65 6275 6646 5043 6369 5432 2061 7474 6163 685f 5f37 6669 6c65 6275 6646 6920 636c 6f73 655f 5f37 6669 6c65 6275
2563600  6646 7620 5c00 5f5f 6474 5f5f 3766 696c 6562 7566 4676 206f 7665 7266 6c6f 775f 5f37 6669 6c65 6275 6646 6920 756e 6465
2563660  7266 6c6f 775f 5f37 6669 6c65 6275 6646 7620 7379 6e63 5f5f 3766 696c 6562 7566 4676 2073 6565 6b6f 6666 5f5f 3766 696c
2563740  6562 7566 466c 3873 6565 6b5f 6469 7269 2073 6574 6275 665f 5f37 6669 6c65 6275 6646 5063 6920 6c61 7374 5f6f 705f 5f37
2564020  6669 6c65 6275 6646 7620 3b6f 7065 6e70 726f 745f 5f37 6669 6c65 6275 6620 3b3b 0066 7374 7265 616d 6261 7365 3a54 2830
2564100  2c37 3029 3d73 3133 3262 7566 5f5f 3131 6673 7472 6561 6d62 6173 653a 2830 2c36 3929 2c30 2c35 3132 3b5f 5f76 7074 725f
2564160  5f31 3166 7374 7265 616d 6261 7365 3a28 302c 3330 292c 3531 322c 3332 3b50 696f 733a 2830 2c33 3329 2c35 3434 2c33 323b
2564240  4f69 6f73 3a28 302c 3233 292c 3537 362c 3438 303b 3b00 6673 7472 6561 6d62 6173 653a 5a63 6673 7472 6561 6d62 6173 653b
2564320  696f 733b 5f5f 6374 5f5f 3131 6673 7472 6561 6d62 6173 6546 7620 5f5f 6374 5f5f 3131 6673 7472 6561 6d62 6173 6546 5043
2564400  6369 5432 205f 5f63 745f 5f31 3166 7374 7265 616d 6261 7365 4669 205f 5f63 745f 5f31 3166 7374 7265 616d 6261 7365 4669
2564460  5063 5431 205f 5f63 745f 5f31 3166 7374 7265 616d 6261 7365 4652 3131 6673 7472 6561 6d62 6173 6520 5f5f 6474 5f5f 3131
2564540  6673 7472 6561 6162 6173 6546 7620 6f7c 656e 5f5f 3131 6673 7472 6561 6d62 6173 6546 5043 6369 5432 205c 0061 7474 6163
2564620  685f 5f31 3166 7374 7265 616d 6261 7365 4669 2063 6c6f 7365 5f5f 3131 6673 7472 6561 6d62 6173 6546 7620 7365 7462 7566
2564700  5f5f 3131 6673 7472 6561 6d62 6173 6546 5063 6920 7264 6275 665f 5f31 3166 7374 7265 616d 6261 7365 4676 2076 6572 6966
2564760  795f 5f31 3166 7374 7265 616d 6261 7365 4669 203b 3b3b 0073 7461 7465 5f76 616c 7565 3a74 2830 2c31 3829 004f 626a 6563
2565040  743a 5428 302c 3731 293d 7334 5f5f 7670 7472 5f5f 364f 626a 6563 743a 2830 2c33 3029 2c30 2c33 323b 3b00 4f62 6a65 6374
2565120  3a5a 634f 626a 6563 743b 3b5f 5f63 745f 5f36 4f62 6a65 6374 4676 205f 5f63 745f 5f36 4f62 6a65 6374 4652 4336 4f62 6a65
```

```
2565200 6374 2065 7272 6f72 4d65 6d6f 7279 5f5f 364f 626a 6563 7446 5063 5431 2065 7870 6c61 696e 5f5f 364f 626a 6563 7446 5063
2565260 2069 6e4f 7264 6572 5f5f 364f 626a 6563 7446 5036 4f62 6a65 6374 203b 3b3b 005f 5f70 7462 6c5f 5f36 4f62 6a65 6374 5f5f
2565340 4669 6c65 556e 5f63 7878 3a47 2830 2c33 3029 0050 463a 7428 302c 3135 2900 5046 433a 7428 302c 3135 2900 5046 493a 7428
2565420 302c 3135 2900 4e4f 626a 6563 743a 5428 302c 3732 293d 7338 5f5f 7670 7472 5f5f 364f 626a 6563 743a 2830 2c33 3029 2c30
2565500 2c33 323b 6e61 6d65 5f5f 374e 4f62 6a65 6374 3a28 302c 3331 292c 3332 2c33 323b 3b00 4e4f 626a 6563 743a 5a63 4e4f 626a
2565560 6563 743b 4f62 6a65 6374 3b5f 5f63 745f 5f37 4e4f 626a 6563 7446 5063 205f 5f63 745f 5f37 4e4f 626a 6563 7446 5243 374e
2565640 4f62 6a65 6374 2073 6574 4e61 6d65 5f5f 374e 4f62 6a65 6374 4650 6320 6765 744e 616d 655f 5f37 4e4f 626a 6563 7446 7620
2565720 6578 706c 6169 6e5f 5f37 4e4f 626a 6563 7446 5063 2067 6574 4174 7472 5f5f 374e 4f62 6a65 6374 4669 2067 6574 5072 6f70
2566000 5f5f 374e 4f62 6a65 6374 4650 6369 2073 6574 5072 6f70 5f5f 374e 4f62 6a65 6374 4650 6354 3120 5c00 7365 7450 726f 705f
2566060 5f37 4e4f 626a 6563 7446 5063 6920 7365 7450 726f 705f 5f37 4e4f 626a 6563 7446 5063 6620 6973 4754 455f 5f37 4e4f 626a
2566140 6563 7446 5036 4f62 6a65 6374 2069 734c 5445 5f5f 374e 4f62 6a65 6374 4650 364f 626a 6563 7420 3b3b 3b00 6f73 7472 6561
2566220 6d5f 7769 7468 6173 7369 676e 3a54 2830 2c33 3729 3d73 3638 5f5f 7670 7472 5f5f 376f 7374 7265 616d 3a28 302c 3330 292c
2566300 302c 3332 3b50 696f 733a 2830 2c33 3329 2c33 322c 3332 3b4f 696f 733a 2830 2c32 3329 2c36 342c 3438 303b 3b00 6f73 7472
2566360 6561 6d5f 7769 7468 6173 7369 676e 3a5a 636f 7374 7265 616d 5f77 6974 6861 7373 6967 6e3b 6f73 7472 6561 6d20 696f 733b
2566440 5f5f 6374 5f5f 3138 6f73 7472 6561 6d5f 7769 7468 6173 7369 676e 4676 205f 5f63 745f 5f31 386f 7374 7265 616d 5f77 6974
2566520 6861 7373 6967 6e46 5231 386f 7374 7265 616d 5f77 6974 6861 7373 6967 6e20 5f5f 6474 5f5f 3138 6f73 7472 6561 6d5f 7769
2566600 7468 6173 7369 676e 4676 205f 5f61 735f 5f31 386f 7374 7265 616d 5f77 6974 6861 7373 6967 6e46 5237 6f73 7472 6561 6d20
2566660 5c00 5f5f 6173 5f5f 3138 6f73 7472 6561 6d5f 7769 7468 6173 7369 676e 4650 3973 7472 6561 6d62 7566 203b 3b3b 0050 4642
2566740 3a74 2830 2c31 3529 004c 4e4f 626a 6563 743a 5428 302c 3733 293d 7331 325f 5f76 7074 725f 5f36 4f62 6a65 6374 3a28 302c
2567020 3330 292c 302c 3332 3b6e 6164 655f 5f37 4e4f 626a 6563 743a 2830 2c33 3129 2c33 322c 3332 3b6e 6578 745f 5f38 4c4e 4f62
2567100 6a65 6374 3a28 302c 3734 293d 2a28 302c 3733 292c 3634 2c33 323b 3b00 4c4e 4f62 6a65 6374 3a5a 634c 4e4f 626a 6563 743b
2567160 4e4f 626a 6563 743b 5f5f 6374 5f5f 3d4c 4e4f 626a 6563 7446 5063 5038 4c4e 4f62 6a65 6374 205f 5f63 745f 5f38 4c4e 4f62
2567240 6a65 6374 4652 4338 4c4e 4f62 6a65 6374 2073 6574 4e65 7874 5f5f 384c 4e4f 626a 6563 7446 5038 4c4e 4f62 6a65 6374 2067
2567320 6574 4e65 7874 5f5f 384c 4e4f 626a 6563 7446 7620 3b3b 3b00 4c4f 626a 6563 743a 5428 302c 3735 293d 7338 5f5f 7670 7472
2567400 5f5f 364f 626a 6563 743a 2830 2c33 3029 2c30 2c33 323b 6e65 7874 5f5f 374c 4f62 6a65 6374 3a28 302c 3736 293d 2a28 302c
2567460 3735 292c 3332 2c33 323b 3b00 4c4f 626a 6563 743a 5a63 4c4f 626a 6563 743b 4f62 6a65 6374 3b5f 5f63 745f 5f37 4c4f 626a
2567540 6563 7446 5037 4c4f 626a 6563 7420 5f5f 6374 5f5f 374c 4f62 6a65 6374 4652 4337 4c4f 626a 6563 7420 7365 744e 6578 745f
2567620 5f37 4c4f 626a 6563 7446 5037 4c4f 626a 6563 7420 6765 744e 6578 745f 5f37 4c4f 626a 6563 7446 7620 3b3b 3b00 4c50 4f62
2567700 6a65 6374 3a54 2830 2c37 3729 3d73 3132 5f5f 7670 7472 5f5f 364f 626a 6563 743a 2830 2c33 3029 2c30 2c33 323b 6e65 7874
2567760 5f5f 374c 4f62 6a65 6374 3a28 302c 3736 292c 3332 2c33 323b 6e6f 626a 7074 725f 5f38 4c50 4f62 6a65 6374 3a28 302c 3738
2570040 293d 2a28 302c 3732 292c 3634 2c33 323b 3b00 4c50 4f62 6a65 6374 3a5a 634c 504f 626a 6563 743b 4c4f 626a 6563 743b 5f5f
2570120 6374 5f5f 384c 504f 626a 6563 7446 5037 4e4f 626a 6563 7450 374c 4f62 6a65 6374 205f 5f63 745f 5f38 4c50 4f62 6a65 6374
2570200 4652 4338 4c50 4f62 6a65 6374 2073 6574 4f62 6a65 6374 5f5f 384c 504f 626a 6563 7446 5037 4e4f 626a 6563 7420 6765 744f
2570260 626a 6563 745f 5f38 4c50 4f62 6a65 6374 4676 2065 7870 6c61 696e 5f5f 384c 504f 626a 6563 7446 5063 203b 3b3b 005f 5f70
2570340 7462 6c5f 5f38 4c50 4f62 6a65 6374 5f5f 4669 6c65 556e 5f63 7878 3a47 2830 2c33 3029 004c 6973 743a 5428 302c 3739 293d
2570420 7331 3263 6f75 6e74 5f5f 344c 6973 743a 2830 2c31 292c 302c 3332 3b70 7472 4c4f 626a 6563 745f 5f34 4c69 7374 3a28 302c
2570500 3736 292c 3332 2c33 323b 5f5f 7670 7472 5f5f 344c 6973 743a 2830 2c33 3029 2c36 342c 3332 3b3b 004c 6973 743a 5a63 4c69
2570560 7374 3b3b 5f5f 6374 5f5f 344c 6973 7446 7620 5f5f 6374 5f5f 344c 6973 7446 5243 344c 6973 7420 5f5f 6474 5f5f 344c 6973
2570640 7446 7620 6765 7443 6f75 6e74 5f5f 344c 6973 7446 7620 6765 7454 6f70 5f5f 344c 6973 7446 7620 7365 7454 6f70 5f5f 344c
2570720 6973 7446 5037 4c4f 626a 6563 7420 6572 726f 724d 656d 6f72 795f 5f34 4c69 7374 4650 6354 3120 6272 6f61 6463 6173 745f
2571000 5f34 4c69 7374 464d 364f 626a 6563 7446 765f 7620 6578 706c 6169 6e5f 5f34 4c69 7374 4650 6320 5c00 696e 7365 7274 5f5f
2571060 344c 6973 7446 5037 4c4f 626a 6563 7420 6973 4d65 6d62 6572 5f5f 344c 6973 7446 5037 4c4f 626a 6563 7420 6973 4d65 6d62
2571140 6572 5f5f 344c 6973 7446 5063 2069 7345 7175 616c 5f5f 344c 6973 7446 5234 4c69 7374 2072 656d 6f76 655f 5f34 4c69 7374
2571220 4650 6320 3b3b 3b00 5f5f 7074 626c 5f5f 344c 6973 745f 5f46 696c 6555 6e5f 6378 783a 4728 302c 3330 2900 504c 6973 743a
2571300 5428 302c 3830 293d 7331 3263 6f75 6e74 5f5f 344c 6973 743a 2830 2c31 292c 302c 3332 3b70 7472 4c4f 626a 6563 745f 5f34
2571360 4c69 7374 3a28 302c 3736 292c 3332 2c33 323b 5f5f 7670 7472 5f5f 344c 6973 743a 2830 2c33 3029 2c36 342c 3332 3b3b 0050
2571440 4c69 7374 3a5a 6350 4c69 7374 3b4c 6973 743b 696e 7365 7274 5f5f 3550 4c69 7374 4650 384c 504f 626a 6563 7420 696e 7365
2571520 7274 5f5f 3550 4c69 7374 4652 3550 4c69 7374 2053 6f72 745f 504c 6973 745f 5f35 504c 6973 7446 6920 7265 7665 7273 655f
2571600 5f35 504c 6973 7446 7620 696e 7365 7274 4166 7465 725f 5f35 504c 6973 7446 5038 4c50 4f62 6a65 6374 5431 2072 656d 6f76
2571660 655f 5f35 504c 6973 7446 5038 4c50 4f62 6a65 6374 2072 656d 6f76 655f 5f35 504c 6973 7446 5063 2069 734d 656d 6265 725f
2571740 5f35 504c 6973 7446 5063 205c 0069 734d 656d 6265 725f 5f35 504c 6973 7446 5037 4c4f 626a 6563 7420 6973 4571 7561 6c5f
2572020 5f35 504c 6973 7446 5234 4c69 7374 2065 7870 6c61 696e 5f5f 3550 4c69 7374 4650 6320 5f5f 6374 5f5f 3550 4c69 7374 4652
2572100 4335 504c 6973 7420 5f5f 6374 5f5f 3550 4c69 7374 4676 203b 3b3b 005f 5f70 7462 6c5f 5f35 504c 6973 745f 5f46 696c 6555
2572160 6e5f 6378 783a 4728 302c 3330 2900 4c69 7374 4974 6572 6174 6f72 3a54 2830 2c38 3129 3d73 386c 6973 745f 5f31 324c 6973
2572240 7449 7465 7261 746f 723a 2830 2c38 3229 3d2a 2830 2c37 3929 2c30 2c33 323b 705f 5f31 324c 6973 7449 7465 7261 746f 723a
```

```
2572320 2830 2c37 3629 2c33 322c 3332 3b3b 004c 6973 7449 7465 7261 746f 723a 5a63 4c69 7374 4974 6572 6174 6f72 3b3b 5f5f 6374
2572400 5f5f 3132 4c69 7374 4974 6572 6174 6f72 4652 344c 6973 7420 7265 7365 745f 5f31 324c 6973 7449 7465 7261 746f 7246 7620
2572460 6174 7461 6368 5f5f 3132 4c69 7374 4974 6572 6174 6f72 4652 344c 6973 7420 6765 7443 7572 7265 6e74 5f5f 3132 4c69 7374
2572540 4974 6572 6174 6f72 4676 205f 5f70 705f 5f31 324c 6973 7449 7465 7261 746f 7246 7620 3b3b 3bC0 5661 6c75 655f 5479 7065
2572620 3a54 2830 2c38 3329 3d65 554e 4b4e 4f57 4e56 3a30 2c53 5452 494e 473a 312c 494e 5445 4745 523a 322c 464c 4f41 543a 332c
2572700 3b00 426c 6f63 6b5f 5479 7065 3a54 2830 2c38 3429 3d65 554e 4b4e 4f57 4e42 3a30 2c45 4e54 4954 593a 312c 4655 4e43 5449
2572760 4f4e 3a32 2c50 524f 4345 4455 5245 3a33 2c3b 0045 6e74 6974 795f 5479 7065 3a54 2830 2c38 3529 3165 554e 4b4e 4f57 4e45
2573040 3a30 2c41 5243 4849 5445 4354 5552 453a 312c 5355 4250 524f 4752 414d 3a32 2c3b 0050 696e 5f54 7970 653a 5428 302c 3836
2573120 293d 6555 4e4b 4e4f 574e 503a 302c 494e 5049 4e3a 312c 4f55 5450 494e 3a32 2c49 4e4f 5554 5049 4e3a 332c 3b00 5061 7261
2573200 5f43 6c61 7373 3a54 2830 2c38 3729 3d65 554e 4b4e 4f57 4e43 3a30 2c46 4f52 4d41 4c3a 312c 4143 5455 414c 3a32 2c52 4553
2573260 4f4c 5645 443a 332c 3b00 424f 4f4c 4541 4e3a 5428 302c 3838 293d 6546 616c 7365 3a30 2c54 7275 653a 312c 3b00 426f 6f6c
2573340 6561 6e3a 5428 302c 3839 293d 6566 616c 7365 3a30 2c74 7275 653a 312c 3b00 4275 6666 6572 3a47 2830 2c33 3129 004d 6f64
2573420 4765 6e3a 5428 302c 3930 293d 7338 4553 7461 7465 5f5f 364d 6f64 4765 6e3a 2830 2c38 3929 2c30 2c33 323b 5f5f 7670 7472
2573500 5f5f 364d 6f64 4765 6e3a 2830 2c33 3029 2c33 322c 3332 3b3b 004d 6f64 4765 6e3a 5a63 4d6f 6447 656e 3b3b 5f5f 6374 5f5f
2573560 364d 6f64 4765 6e46 7620 5f5f 6374 5f5f 364d 6f64 4765 6e46 5243 364d 6f64 4765 6e20 7365 745f 4553 7461 7465 5f5f 364d
2573640 6f64 4765 6e46 3742 6f6f 6c65 616e 2067 6574 5f45 5374 6174 655f 5f36 4d6f 6447 656e 4676 2073 6574 496e 6465 785f 5f36
2573720 4d6f 6447 656e 4676 2073 6574 4e61 6d65 496e 6465 785f 5f36 4d6f 6447 656e 4650 6320 4c6f 6164 5f56 4844 4c5f 4461 7461
2574000 5f5f 364d 6f64 4765 6e46 5037 4e4f 626a 6563 7420 5c00 436f 6d70 6f73 655f 4d6f 6447 656e 5f44 6573 6372 6970 746f 725f
2574060 5f36 4d6f 6447 656e 4650 6320 6578 706c 6169 6e5f 5f36 4d6f 6447 656e 4676 203b 3b3b 005f 5f70 7462 6c5f 5f36 4d6f 6447
2574140 656e 5f5f 4669 6c65 556e 5f63 7878 3a47 2830 2c33 3029 0049 4f5f 4d61 6e61 6765 723a 5428 302c 3931 293d 7333 3669 6670
2574220 5f5f 3130 494f 5f4d 616e 6167 6572 3a28 302c 3637 292c 302c 3332 3b6f 6670 5f5f 3130 494f 5f4d 616e 6167 6572 3a28 302c
2574300 3637 292c 3332 2c33 323b 6d66 705f 5f31 3049 4f5f 4d61 6e61 6765 723a 2830 2c36 3729 2c36 342c 3332 3b63 6670 5f5f 3130
2574360 494f 5f4d 616e 6167 6572 3a28 302c 3637 292c 3936 2c33 323b 4946 696c 654e 616d 655f 5f31 3049 4f5f 4d61 6e61 6765 723a
2574440 2830 2c33 3129 2c31 3238 2c33 323b 4f46 696c 654e 616d 655f 5f31 3049 4f5f 4d61 6e61 6765 723a 2830 2c33 3129 2c31 3630
2574520 2c33 323b 4d46 696c 654e 616d 655f 5f31 3049 4f5f 4d61 6e61 6765 723a 2830 2c33 3129 2c31 3932 2c33 323b 4346 696c 654e
2574600 616d 655f 5f31 3049 4f5f 4d61 6e61 6765 723a 2830 2c33 3129 2c32 3234 2c33 323b 6375 4c69 6e65 5f5f 3130 494f 5f4d 616e
2574660 6167 6572 3a28 302c 3129 2c32 3536 2c33 323b 3b00 494f 5f4d 616e 6167 6572 3a5a 6349 4f5f 4d61 6e61 6765 723b 3b5f 5f63
2574740 745f 5f31 3049 4f5f 4d61 6e61 6765 7246 5063 205f 5f64 745f 5f31 3049 4f5f 4d61 6e61 6765 7246 7620 494f 4368 6563 6b5f
2575020 5f31 3049 4f5f 4161 6e61 6765 7246 7620 436f 7079 4669 6c65 546f 4c69 6e65 5f5f 3130 494f 5f4d 616e 6167 6572 4669 2043
2575100 6f70 7946 696c 6554 6f45 6e64 5f5f 3130 494f 5f4d 616e 6167 6572 4676 2053 7461 746d 656e 7448 616e 6465 6c65 725f 5f31
2575160 3049 4f5f 4d61 6e61 6765 7246 5063 5431 6920 5c00 436f 7079 4669 6c65 546f 4b65 7957 5f5f 3130 494f 5f4d 616e 6167 6572
2575240 4650 6354 3120 4561 745f 5374 6174 656d 656e 745f 5f31 3049 4f5f 4d61 6e61 6765 7246 5063 5431 2057 5f4f 7574 4669 6c65
2575320 5f5f 3130 494f 5f4d 616e 6167 6572 4650 6320 575f 4146 696c 655f 5f31 3049 4f5f 4d61 6e61 6765 7246 5063 2057 5f43 4669
2575400 6c65 5f5f 3130 494f 5f4d 616e 6167 6572 4650 6320 3b3b 3b00 656e 7469 7479 3a54 2830 2c39 3229 3473 3630 5f5f 7670 7472
2575460 5f5f 364f 626a 6563 743a 2830 2c33 3029 2c30 2c33 323b 6e61 6d65 5f5f 374e 4f62 6a65 6374 3a28 302c 3331 292c 3332 2c33
2575540 323b 6e61 6d65 5f5f 3665 6e74 6974 793a 2830 2c33 3129 2c36 342c 3332 3b46 696c 654e 616d 655f 5f36 656e 7469 7479 3a28
2575620 302c 3331 292c 3336 2c33 323b 6172 6368 6e61 6d65 5f5f 3665 6e74 6974 793a 2830 2c33 3129 2c31 3238 2c33 323b 7479 7065
2575700 5f5f 3665 6e74 6974 793a 2830 2c31 292c 3136 302c 3332 3b61 7263 685f 6c69 6e65 5f5f 3665 6e74 6974 793a 2830 2c31 292c
2575760 3139 322c 3332 3b63 616c 6c5f 6c69 6e65 5f5f 3665 6e74 6974 793a 2830 2c31 292c 3232 342c 3332 3b5c 0070 7263 735f 6c69
2576040 6e65 5f5f 3665 6e74 6974 793a 2830 2c31 292c 3235 362c 3332 3b71 7561 6c69 6669 6564 5f5f 3665 6e74 6974 793a 2830 2c38
2576120 3029 2c32 3838 2c39 363b 7375 625f 626c 6f63 6b73 5f5f 3665 6e74 6974 793a 2830 2c38 3029 2c33 3834 2c39 363b 3b00 656e
2576200 7469 7479 3a5a 6365 6e74 6974 793b 4e4f 626a 6563 743b 5f5f 6374 5f5f 3665 6e74 6974 7946 7620 5f5f 6374 5f5f 3665 6e74
2576260 6974 7946 5243 3665 6e74 6974 7920 5f5f 6474 5f5f 3665 6e74 6974 7946 7620 7365 745f 656e 7469 7479 5f6e 616d 655f 5f36
2576340 656e 7469 7479 4650 6320 7365 745f 656e 7469 7479 5f66 696c 655f 5f36 656e 7469 7479 4650 6320 7365 745f 656e 7469 7479
2576420 5f61 7263 686e 616d 655f 5f36 656e 7469 7479 4650 6320 7365 745f 656e 7469 7479 5f74 7970 655f 5f36 656e 7469 7479 4650
2576500 6320 5c00 7365 745f 6172 6368 5f6c 696e 655f 5f36 656e 7469 7479 4669 2073 6574 5f63 616c 6c5f 6c69 6e65 5f5f 3665 6e74
2576560 6974 7946 6920 7365 745f 7072 6373 5f6c 696e 655f 5f36 656e 7469 7479 4669 2067 6574 5f65 6e74 6974 795f 6e61 6d65 5f5f
2576640 3665 6e74 6974 7946 7620 6765 745f 656e 7469 7479 5f61 7263 686e 616d 655f 5f36 656e 7469 7479 4676 2067 6574 5f65 6e74
2576720 6974 795f 6669 6c65 5f5f 3665 6e74 6974 7946 7620 6765 745f 656e 7469 7479 5f74 7970 655f 5f36 656e 7469 7479 4676 205c
2577000 0067 6574 5f61 7263 685f 6c69 6e65 5f5f 3665 6e74 6974 7946 7620 6765 745f 6361 6c6c 5f6c 696e 655f 5f36 656e 7469 7479
2577060 4676 2067 6574 5f70 7263 735f 6c69 6e65 5f5f 3665 6e74 6974 7946 7620 6973 4754 455f 5f36 656e 7469 7479 4650 364f 626a
2577140 6563 7420 6973 4c54 455f 5f36 656e 7469 7479 4650 364f 626a 6563 7420 6578 706c 6169 6e5f 5f36 656e 7469 7479 4650 6320
2577220 3b3b 3b00 5f5f 7074 626c 5f5f 3665 6e74 6974 795f 5f46 696c 6555 6e5f 6378 783a 4728 302c 3330 2900 626c 6f63 6b3a 5428
2577300 302c 3933 293d 7331 3430 5f5f 7670 7472 5f5f 364f 626a 6563 743a 2830 2c33 3029 2c30 2c33 323b 6e61 6d65 5f5f 374e 4f62
2577360 6a65 6374 3a28 302c 3331 292c 3332 2c33 323b 6e61 6d65 5f5f 3562 6c6f 636b 3a28 302c 3331 292c 3634 2c33 323b 7479 7065
```

| | | | | | | | | | | | | | | | | | | | | | | | | |
|---|---|---|---|---|---|---|---|---|---|---|---|---|---|---|---|---|---|---|---|---|---|---|---|---|
| 2577440 | 5f5f | 3562 | 6c6f | 636b | 3a28 | 302c | 3129 | 2c39 | 362c | 3332 | 3b4d | 475f | 4e61 | 6d65 | 5f5f | 3562 | 6c6f | 636b | 3a28 | 302c | 3331 | 292c | 3132 | 382c |
| 2577520 | 3332 | 3b4d | 475f | 5479 | 7065 | 5f5f | 3562 | 6c6f | 636b | 3a28 | 302c | 3331 | 292c | 3136 | 302c | 3332 | 3b4d | 475f | 5375 | 6254 | 7970 | 655f | 5f35 | 626c |
| 2577600 | 6f63 | 6b3a | 2830 | 2c33 | 3129 | 2c31 | 3932 | 2c33 | 323b | 5061 | 7265 | 6e74 | 5f5f | 3562 | 6c6f | 636b | 3a28 | 302c | 3932 | 292c | 3232 | 342c | 3438 | 303b |
| 2577660 | 5c00 | 4d47 | 4473 | 6372 | 7074 | 6e5f | 5f35 | 626c | 6f63 | 6b3a | 2830 | 2c39 | 3429 | 3d2a | 2830 | 2c39 | 3029 | 2c37 | 3034 | 2c33 | 323b | 4163 | 7475 | 616c |
| 2577740 | 5f5f | 3562 | 6c6f | 636b | 3a28 | 302c | 3830 | 292c | 3733 | 362c | 3936 | 3b46 | 6f72 | 6d61 | 6c5f | 5f35 | 626c | 6f63 | 6b3a | 2830 | 2c38 | 3029 | 2c38 | 3332 |
| 2600020 | 2c39 | 363b | 5265 | 736f | 6c76 | 6564 | 5f5f | 3562 | 6c6f | 636b | 3a28 | 302c | 3830 | 292c | 3932 | 382c | 3936 | 3b41 | 7474 | 7269 | 6275 | 7465 | 735f | 5f35 |
| 2600100 | 626c | 6f63 | 6b3a | 2830 | 2c38 | 3029 | 2c31 | 3032 | 342c | 3936 | 3b3b | 0062 | 6c6f | 636b | 3a5a | 6362 | 6c6f | 636b | 3b4e | 4f62 | 6a65 | 6374 | 3b5f | 5f63 |
| 2600160 | 745f | 5f35 | 626c | 6f63 | 6b46 | 7620 | 5f5f | 6374 | 5f5f | 3562 | 6c6f | 636b | 4652 | 4335 | 626c | 6f63 | 6b20 | 5f5f | 6474 | 5f5f | 3562 | 6c6f | 636b | 4676 |
| 2600240 | 2073 | 6574 | 5f62 | 6c6f | 636b | 5f6e | 616d | 655f | 5f35 | 626c | 6f63 | 6b46 | 5063 | 2073 | 6574 | 5f62 | 6c6f | 636b | 5f74 | 7970 | 655f | 5f35 | 626c | 6f63 |
| 2600320 | 6b46 | 5063 | 2067 | 6574 | 5f62 | 6c6f | 636b | 5f6e | 616d | 655f | 5f35 | 626c | 6f63 | 6b46 | 7620 | 6765 | 745f | 626c | 6f63 | 6b5f | 7479 | 7065 | 5f5f | 3562 |
| 2600400 | 6c6f | 636b | 4676 | 2067 | 6574 | 5f62 | 6c6f | 636b | 5f70 | 6172 | 656e | 745f | 5f35 | 626c | 6f63 | 6b46 | 7620 | 5c00 | 6765 | 745f | 466f | 726d | 616c | 5f5f |
| 2600460 | 3562 | 6c6f | 636b | 4676 | 2067 | 6574 | 5f41 | 6374 | 7561 | 6c5f | 5f35 | 626c | 6f63 | 6b46 | 7620 | 6765 | 745f | 5265 | 736f | 6c76 | 6564 | 5f5f | 3562 | 6c6f |
| 2600540 | 636b | 4676 | 2067 | 6574 | 5f41 | 7474 | 7269 | 6275 | 7465 | 5f5f | 3562 | 6c6f | 636b | 4676 | 2067 | 6574 | 5f63 | 6f6d | 705f | 6c65 | 6e67 | 7468 | 5f5f | 3562 |
| 2600620 | 6c6f | 636b | 4676 | 2069 | 7351 | 7561 | 6c69 | 6669 | 6564 | 5f5f | 3562 | 6c6f | 636b | 4676 | 2069 | 734c | 5445 | 5f5f | 3562 | 6c6f | 636b | 4650 | 364f | 626a |
| 2600700 | 6563 | 7420 | 6973 | 4754 | 455f | 5f35 | 626c | 6f63 | 6b46 | 5036 | 4f62 | 6a65 | 6374 | 2065 | 7870 | 6c61 | 696e | 5f5f | 3562 | 6c6f | 636b | 4650 | 6320 | 5c00 |
| 2600760 | 5265 | 7665 | 7273 | 6541 | 6c6c | 4c69 | 7374 | 735f | 5f35 | 626c | 6f63 | 6b46 | 7620 | 4368 | 6563 | 6b50 | 6172 | 614c | 6973 | 7473 | 5f5f | 3562 | 6c6f | 636b |
| 2601040 | 4676 | 2043 | 6865 | 636b | 5061 | 7261 | 6d4c | 6973 | 745f | 5f35 | 626c | 6f63 | 6b46 | 5035 | 504c | 6973 | 7420 | 575f | 5648 | 444c | 5f43 | 6f6d | 7049 | 6e73 |
| 2601120 | 745f | 5f35 | 626c | 6f63 | 6b46 | 7620 | 575f | 5648 | 444c | 5f43 | 6f6d | 7044 | 6563 | 5f5f | 3562 | 6c6f | 636b | 4676 | 2067 | 6574 | 5f56 | 4844 | 4c5f | 436f |
| 2601200 | 6d70 | 4c61 | 626c | 655f | 5f35 | 626c | 6f63 | 6b46 | 5063 | 2067 | 6574 | 5f56 | 4844 | 4c5f | 436f | 6d70 | 4e61 | 6d65 | 5f5f | 3562 | 6c6f | 636b | 4650 | 6320 |
| 2601260 | 5c00 | 575f | 4d47 | 5f43 | 6f6d | 7044 | 7363 | 7270 | 746e | 5f5f | 3562 | 6c6f | 636b | 4676 | 2057 | 5f4d | 475f | 4368 | 6563 | 6b43 | 6f6d | 705f | 5f35 | 626c |
| 2601340 | 6f63 | 6b46 | 7620 | 575f | 434c | 5f41 | 7263 | 6842 | 6f64 | 795f | 5f35 | 626c | 6f63 | 6b46 | 7620 | 575f | 434c | 5f45 | 6e74 | 6974 | 7944 | 6563 | 5f5f | 3562 |
| 2601420 | 6c6f | 636b | 4676 | 203b | 3b3b | 005f | 5f70 | 7462 | 6c5f | 5f35 | 626c | 6f63 | 6b5f | 5f46 | 696c | 6555 | 6e5f | 6378 | 783a | 4728 | 302c | 3330 | 2900 | 5f5f |
| 2601500 | 6374 | 5f5f | 3665 | 6e74 | 6974 | 7946 | 763a | 6628 | 302c | 3335 | 293d | 2a28 | 302c | 3932 | 2900 | 5f5f | 3074 | 6869 | 733a | 7028 | 302c | 3935 | 2900 | 2e2f |
| 2601560 | 6878 | 782f | 656e | 7469 | 7479 | 2e68 | 7878 | 005f | 5f30 | 7468 | 6973 | 3a72 | 2830 | 2c39 | 3529 | 005f | 5f30 | 7468 | 6973 | 203a | 5a74 | 6c00 | 5f5f | 6374 |
| 2601640 | 5f5f | 3665 | 6e74 | 6974 | 7946 | 7620 | 3a5a | 7446 | 0044 | 6573 | 6967 | 6e55 | 6e69 | 743a | 5428 | 302c | 3936 | 293d | 7335 | 325f | 5f76 | 7074 | 725f | 5f36 |
| 2601720 | 4f62 | 6a65 | 6374 | 3a28 | 302c | 3330 | 292c | 302c | 3332 | 3b6e | 616d | 655f | 5f37 | 4e4f | 626a | 6563 | 743a | 2830 | 2c33 | 3129 | 2c33 | 322c | 3332 | 3b44 |
| 2602000 | 6555 | 6e4e | 616d | 655f | 5f31 | 3044 | 6573 | 6967 | 6e55 | 6e69 | 743a | 2830 | 2c33 | 3129 | 2c36 | 342c | 3332 | 3b46 | 696c | 654e | 616d | 655f | 5f31 | 3044 |
| 2602060 | 6573 | 6967 | 6e55 | 6e69 | 743a | 2830 | 2c33 | 3129 | 2c39 | 362c | 3332 | 3b41 | 7263 | 684e | 616d | 655f | 5f31 | 3044 | 6573 | 6967 | 6e55 | 6e69 | 743a | 2830 |
| 2602140 | 2c33 | 3129 | 2c31 | 3230 | 2c33 | 323b | 4465 | 556e | 5479 | 7065 | 5f5f | 3130 | 4465 | 7369 | 676e | 556e | 6974 | 3a28 | 302c | 3129 | 2c31 | 3630 | 2c33 | 323b |
| 2602220 | 4172 | 6368 | 4c69 | 6e65 | 5f5f | 3130 | 4465 | 7369 | 676e | 556e | 6974 | 3a28 | 302c | 3129 | 2c31 | 3932 | 2c33 | 323b | 5175 | 616c | 6966 | 6965 | 645f | 5f31 |
| 2602300 | 3044 | 6573 | 6967 | 6e55 | 6e69 | 743a | 2830 | 2c38 | 3029 | 2c32 | 3234 | 2c39 | 363b | 5375 | 6242 | 6c6f | 636b | 735f | 5f31 | 3044 | 6573 | 6967 | 6e55 | 6e69 |
| 2602360 | 743a | 2830 | 2c38 | 3029 | 2c33 | 3230 | 2c39 | 363b | 3b00 | 4465 | 7369 | 676e | 556e | 6974 | 3a5a | 6344 | 6573 | 6967 | 6e55 | 6e69 | 743b | 4e4f | 626a | 6563 |
| 2602440 | 743b | 5f5f | 6374 | 5f5f | 3130 | 4465 | 7369 | 676e | 556e | 6974 | 4676 | 205f | 5f63 | 745f | 5f31 | 3044 | 6573 | 6967 | 6e55 | 6e69 | 7446 | 5063 | 205f | 5f63 |
| 2602520 | 745f | 5f31 | 3044 | 6573 | 6967 | 6e55 | 6e69 | 7446 | 5036 | 656e | 7469 | 7479 | 205f | 5f63 | 745f | 5f31 | 3044 | 6573 | 6967 | 6e55 | 6e69 | 7446 | 5243 | 3130 |
| 2602600 | 4465 | 7369 | 676e | 556e | 6974 | 205f | 5f64 | 745f | 5f31 | 3044 | 6573 | 6967 | 6e55 | 6e69 | 7446 | 7620 | 7365 | 745f | 4455 | 5f44 | 6555 | 6e4e | 616d | 655f |
| 2602660 | 5f31 | 3044 | 6573 | 6367 | 6e55 | 6e69 | 7446 | 5063 | 205c | 0073 | 6574 | 5f44 | 555f | 4669 | 6c65 | 4e61 | 6d65 | 5f5f | 3130 | 4465 | 7369 | 676e | 556e | 6974 |
| 2602740 | 4650 | 6320 | 7365 | 745f | 4455 | 5f41 | 7263 | 684e | 616d | 655f | 5f31 | 3044 | 6573 | 6967 | 6e55 | 6e69 | 7446 | 5063 | 2073 | 6574 | 5f44 | 555f | 4465 | 556e |
| 2603020 | 5479 | 7065 | 5f5f | 3130 | 4465 | 7369 | 676e | 556e | 6974 | 4669 | 2073 | 6574 | 5f44 | 555f | 4172 | 6368 | 4c69 | 6e65 | 5f5f | 3130 | 4465 | 7369 | 676e | 556e |
| 2603100 | 6974 | 4669 | 2067 | 6574 | 5f44 | 555f | 4669 | 6c65 | 4e61 | 6d65 | 5f5f | 3130 | 4465 | 7369 | 676e | 556e | 6974 | 4676 | 2045 | 7175 | 616c | 5f5f | 3130 | 4465 |
| 2603160 | 7369 | 676e | 556e | 6974 | 4650 | 3665 | 6e74 | 6974 | 7920 | 5c00 | 6973 | 4754 | 455f | 5f31 | 3044 | 6573 | 6967 | 6e55 | 6e69 | 7446 | 5036 | 4f62 | 6a65 | 6374 |
| 2603240 | 2069 | 734c | 5445 | 5f5f | 3130 | 4465 | 7369 | 676e | 556e | 6974 | 4650 | 364f | 626a | 6563 | 7420 | 6765 | 745f | 4455 | 5f51 | 7561 | 6c69 | 6669 | 6564 | 5f5f |
| 2603320 | 3130 | 4465 | 7369 | 676e | 556e | 6974 | 4676 | 2067 | 6574 | 5f44 | 555f | 5375 | 6242 | 6c6f | 636b | 735f | 5f31 | 3044 | 6573 | 6967 | 6e55 | 6e69 | 7446 | 7620 |
| 2603400 | 4578 | 7061 | 6e64 | 5f56 | 4844 | 4c5f | 4455 | 5f5f | 3130 | 4465 | 7369 | 676e | 556e | 6974 | 4676 | 2065 | 7870 | 6c61 | 696e | 5f5f | 3130 | 4465 | 7369 | 676e |
| 2603460 | 556e | 6974 | 4650 | 6320 | 3b3b | 3b00 | 5f5f | 7074 | 626c | 5f5f | 3130 | 4465 | 7369 | 676e | 556e | 6974 | 5f5f | 4669 | 6c65 | 556e | 5f63 | 7878 | 3a47 | 2830 |
| 2603540 | 2c33 | 3029 | 0046 | 696c | 6555 | 6e69 | 743a | 5428 | 302c | 3937 | 293d | 7332 | 345f | 5f76 | 7074 | 725f | 5f36 | 4f62 | 6a65 | 6374 | 3a28 | 302c | 3330 | 292c |
| 2603620 | 302c | 3332 | 3b6e | 616d | 655f | 5f37 | 4e4f | 626a | 6563 | 743a | 2830 | 2c33 | 3129 | 2c33 | 322c | 3332 | 3b46 | 696c | 654e | 616d | 655f | 5f38 | 4669 | 6c65 |
| 2603700 | 556e | 6974 | 3a28 | 302c | 3331 | 292c | 3634 | 2c33 | 323b | 456e | 7469 | 7479 | 4c69 | 7374 | 5f5f | 3846 | 696c | 6555 | 6e69 | 743a | 2830 | 2c38 | 3029 | 2c39 |
| 2603760 | 362c | 3936 | 3b3b | 0046 | 696c | 6555 | 6e69 | 743a | 5a63 | 4669 | 6c65 | 556e | 6974 | 3b4e | 4f62 | 6a65 | 6374 | 3b5f | 5f63 | 745f | 5f38 | 4669 | 6c65 | 556e |
| 2604040 | 6974 | 4676 | 205f | 5f63 | 745f | 5f38 | 4669 | 6c65 | 556e | 6974 | 4650 | 6320 | 5f5f | 6374 | 5f5f | 3846 | 696c | 6555 | 6e69 | 7446 | 5243 | 3846 | 696c | 6555 |
| 2604120 | 6e69 | 7420 | 5f5f | 6474 | 5f5f | 3846 | 696c | 6555 | 6e69 | 7446 | 7620 | 7365 | 745f | 4655 | 5f46 | 696c | 654e | 616d | 655f | 5f38 | 4669 | 6c65 | 556e | 6974 |
| 2604200 | 4650 | 6320 | 6765 | 745f | 4655 | 5f46 | 696c | 654e | 616d | 655f | 5f38 | 4669 | 6c65 | 556e | 6974 | 4676 | 2067 | 6574 | 5f45 | 6e74 | 6974 | 794c | 6973 | 745f |
| 2604260 | 5f38 | 4669 | 6c65 | 556e | 6974 | 4676 | 205c | 0045 | 7870 | 616e | 645f | 5648 | 444c | 5f44 | 555f | 5f38 | 4669 | 6c65 | 556e | 6974 | 4676 | 2065 | 7870 | 6c61 |
| 2604340 | 696e | 5f5f | 3846 | 696c | 6555 | 6e69 | 7446 | 5063 | 203b | 3b3b | 005f | 5f70 | 7462 | 6c5f | 5f38 | 4669 | 6c65 | 556e | 6974 | 5f5f | 4669 | 6c65 | 556e | 5f63 |
| 2604420 | 7878 | 3a47 | 2830 | 2c33 | 3029 | 0049 | 4f4d | 3a47 | 2830 | 2c39 | 3829 | 3d2a | 2830 | 2c39 | 3129 | 0065 | 7870 | 6c61 | 696e | 5f5f | 3846 | 696c | 6555 | 6e69 |
| 2604500 | 7446 | 5063 | 3a46 | 2830 | 2c32 | 2900 | 5f5f | 3074 | 6869 | 733a | 7028 | 302c | 3939 | 293d | 2a28 | 302c | 3937 | 2900 | 5f5f | 3073 | 3a70 | 2830 | 2c33 | 3129 |

```
2604560 0046 696c 6555 6e2e 6378 7800 5f5f 3074 6869 733a 7228 302c 3939 2900 5f5f 3074 6869 7320 3a5a 746c 005f 5f30 7320 3a5a
2604640 746c 0065 7870 6c61 696e 5f5f 3846 696c 6555 6e69 7446 5063 203a 5a74 4600 5f5f 6474 5f5f 3130 494f 5f4d 616e 6167 6572
2604720 4676 3a66 2830 2c32 2900 5f5f 3074 6869 733a 7028 302c 3938 2900 5f5f 305f 5f66 7265 653a 7028 302c 3129 002e 2f68 7878
2605000 2f49 4f4d 616e 2e68 7878 005f 5f30 7468 6973 3a72 2830 2c39 3829 005f 5f30 7468 6973 203a 5a74 6c00 5f5f 305f 5f66 7265
2605060 6520 3a5a 746c 005f 5f64 745f 5f31 3049 4f5f 4d61 6e61 6765 7246 7620 3a5a 7446 0045 7870 616e 645f 5648 444c 5f44 555f
2605140 5f38 4669 6c65 556e 6974 4676 3a46 2830 2c32 2900 5f5f 3074 6869 733a 7028 302c 3939 2900 4669 6c65 556e 2e63 7878 005f
2605220 5f30 7468 6973 3a72 2830 2c39 3929 005f 5f31 4c3a 2830 2c37 3629 005f 5f31 443a 2830 2c31 3030 293d 2a28 302c 3936 2900
2605300 5f5f 314c 493a 2830 2c38 3129 005f 5f30 5f5f 5874 6869 7330 3061 6e67 7a66 6e3a 2830 2c39 3829 005f 5f30 7468 6973 203a
2605360 5a74 6c00 5f5f 314c 203a 5a74 6c00 5f5f 3144 203a 5a74 6c00 5f5f 314c 4920 3a5a 746c 005f 5f30 5f5f 5874 6869 7330 3061
2605440 6e67 7a66 6e20 3a5a 746c 0045 7870 616e 645f 5648 444c 5f44 555f 5f38 4669 6c65 556e 6974 4676 203a 5a74 4600 5f5f 7374
2605520 695f 5f46 696c 6555 6e5f 6378 785f 6578 706c 6169 6e5f 3a46 2830 2c32 2900 2f75 7372 2f43 432f 7375 6e34 2f69 6e63 6c2f
2605600 696f 7374 7265 616d 2e68 005f 5f73 7464 5f5f 4669 6c65 556e 5f63 7878 5f65 7870 6c61 696e 5f3a 4628 302c 3229 005f 5f76
2605660 7462 6c5f 5f38 4669 6c65 556e 6974 3a47 2830 2c31 3031 293d 6172 2830 2c31 293b 303b 3130 3b28 302c 3135 2900 5f5f 7674
2605740 626c 5f5f 384c 504f 626a 6563 745f 5f46 696c 6555 6e5f 6378 783a 4728 302c 3130 3229 3d61 7228 302c 3129 3b30 3b33 3b28
2606020 302c 3135 2900 7365 745f 4655 5f46 696c 654e 616d 655f 5f38 4669 6c65 556e 6974 4650 633a 6628 302c 3229 005f 5f30 7468
2606100 6973 3a70 2830 2c39 3929 005f 5f30 733a 7028 302c 3331 2900 2e2f 6878 782f 4669 6c65 556e 2e68 7878 005f 5f30 7468 6973
2606160 3a72 2830 2c39 3929 005f 5f30 7468 6973 203a 5a74 6c00 5f5f 3073 203a 5a74 6c00 7365 745f 4655 5f46 696c 654e 616d 655f
2606240 5f38 4669 6c65 556e 6974 4650 6320 3a5a 7446 0065 7870 6c61 696e 5f5f 384c 504f 626a 6563 7446 5063 3a66 2830 2c32 2900
2606320 5f5f 3074 6869 733a 7028 302c 3130 3329 3d2a 2830 2c37 3729 005f 5f30 733a 7028 302c 3331 2900 2f68 6f6d 652f 6f73 6173
2606400 312f 612f 6162 2f73 7263 2f6e 6577 6f62 6a65 6374 732f 6878 782f 4c50 4f62 6a65 6374 5f64 622e 6878 7800 5f5f 3074 6869
2606460 733a 7228 302c 3130 3329 005f 5f30 7468 6973 203a 5a74 6c00 5f5f 3073 203a 5a74 6c00 6578 706c 6169 6e5f 5f38 4c50 4f62
2606540 6a65 6374 4650 6320 3a5a 7446 0069 734c 5445 5f5f 374e 4f62 6a65 6374 4650 364f 626a 6563 743a 6628 302c 3129 005f 5f30
2606620 7468 6973 3a70 2830 2c37 3829 005f 5f30 5f5f 4133 393a 7028 302c 3130 3429 3d2a 2830 2c37 3129 002f 686f 6d65 2f6f 7361
2606700 7331 2f61 2f61 622f 7372 632f 6e65 776f 626a 6563 7473 2f68 7878 2f4e 4f62 6a65 6374 5f64 622e 6878 7800 5f5f 3074 6869
2606760 7320 3a5a 746c 005f 5f30 5f5f 4133 3920 3a5a 746c 0069 734c 5445 5f5f 374e 4f62 6a65 6374 4650 364f 626a 6563 7420 3a5a
2607040 7446 0069 7347 5445 5f5f 374e 4f62 6a65 6374 4650 364f 626a 6563 743a 6628 302c 3129 005f 5f30 7468 6973 3a70 2830 2c37
2607120 3829 005f 5f30 5f5f 4133 393a 7028 302c 3130 3429 005f 5f30 7468 6973 203a 5a74 6c00 5f5f 305f 5f41 3338 203a 5a74 6c00
2607200 6973 4754 455f 5f37 4e4f 626a 6563 7446 5036 4f62 6a65 6374 203a 5a74 4600 7365 7450 726f 705f 5f37 4e4f 626a 6563 7446
2607260 5063 663a 6628 302c 3229 005f 5f30 7468 6973 3a70 2830 2c37 3829 005f 5f31 5f5f 4133 363a 7028 302c 3331 2900 5f5f 315f
2607340 5f41 3337 3a70 2830 2c31 3029 005f 5f30 7468 6973 203a 5a74 6c00 5f5f 315f 5f41 3336 203a 5a74 6c00 5f5f 315f 5f41 3337
2607420 203a 5a74 6c00 7365 7450 726f 705f 5f37 4e4f 626a 6563 7446 5063 6620 3a5a 7446 0073 6574 5072 6f70 5f5f 374e 4f62 6a65
2607500 6374 4650 6369 3a66 2830 2c32 2900 5f5f 3074 6869 733a 7028 302c 3738 2900 5f5f 315f 5f41 3334 3a70 2830 2c33 3129 005f
2607560 5f31 5f5f 4133 353a 7028 302c 3129 005f 5f30 7468 6973 203a 5a74 6c00 5f5f 315f 5f41 3334 203a 5a74 6c00 5f5f 315f 5f41
2607640 3335 203a 5a74 6c00 7365 7450 726f 705f 5f37 4e4f 626a 6563 7446 5063 6920 3a5a 7446 0073 6574 5072 6f70 5f5f 374e 4f62
2607720 6a65 6374 4650 6354 313a 6628 302c 3229 005f 5f30 7468 6973 3a70 2830 2c37 3829 005f 5f31 5f5f 4133 323a 7028 302c 3331
2610000 2900 5f5f 315f 5f41 3333 3a70 2830 2c33 3129 005f 5f30 7468 6973 203a 5a74 6c00 5f5f 315f 5f41 3332 203a 5a74 6c00 5f5f
2610060 315f 5f41 3333 203a 5a74 6c00 7365 7450 726f 705f 5f37 4e4f 626a 6563 7446 5063 5431 203a 5a74 4600 6765 7450 726f 705f
2610140 5f37 4e4f 626a 6563 7446 5063 693a 6628 302c 3331 2900 5f5f 3074 6869 733a 7028 302c 3738 2900 5f5f 305f 5f41 3330 3a70
2610220 2830 2c33 3129 005f 5f30 5f5f 4133 313a 7028 302c 3129 005f 5f30 7468 6973 203a 5a74 6c00 5f5f 305f 5f41 3330 203a 5a74
2610300 6c00 5f5f 305f 5f41 3331 203a 5a74 6c00 6765 7450 726f 705f 5f37 4e4f 626a 6563 7446 5063 6920 3a5a 7446 0067 6574 4174
2610360 7472 5f5f 374e 4f62 6a65 6374 4669 3a66 2830 2c33 3129 005f 5f30 7468 6973 3a70 2830 2c37 3829 005f 5f30 5f5f 4132 393a
2610440 7028 302c 3129 005f 5f30 7468 6973 203a 5a74 6c00 5f5f 305f 5f41 3239 203a 5a74 6c00 6765 7441 7474 725f 5f37 4e4f 626a
2610520 6563 7446 6920 3a5a 7446 0069 6e4f 7264 6572 5f5f 364f 626a 6563 7446 5036 4f62 6a65 6374 3a66 2830 2c31 2900 5f5f 3074
2610600 6869 733a 7028 302c 3130 3429 005f 5f30 5f5f 4132 373a 7028 302c 3130 3429 002f 686f 6d65 2f6f 7361 7331 2f61 2f61 622f
2610660 7372 632f 6e65 776f 626a 6563 7473 2f68 7878 2f4f 626a 6563 745f 6462 2e68 7878 005f 5f30 7468 6973 203a 5a74 6c00 5f5f
2610740 305f 5f41 3237 203a 5a74 6c00 696e 4f72 6465 725f 5f36 4f62 6a65 6374 4650 364f 626a 6563 7420 3a5a 7446 0041 6c6c 426c
2611020 6f63 6b73 2e6f 005f 7365 7450 726f 705f 5f37 4e4f 626a 6563 7446 5063 6600 5f73 6574 5072 6f70 5f5f 374e 4f62 6a65 6374
2611100 4650 6369 005f 6765 7441 7474 725f 5f37 4e4f 626a 6563 7446 6900 5f73 6574 5f46 555f 4669 6c65 4e61 6d65 5f5f 3846 696c
2611160 6555 6e69 7446 5063 005f 7075 745f 5f37 6f73 7472 6561 6d46 6300 5f73 6574 5072 6f70 5f5f 374e 4f62 6a65 6374 4650 6354
2611240 3100 5f69 6f73 7472 6561 6d5f 696e 6974 005f 6973 4c54 455f 5f37 4e4f 626a 6563 7446 5036 4f62 6a65 6374 005f 6973 4754
2611320 455f 5f37 4e4f 626a 6563 7446 5036 4f62 6a65 6374 005f 6578 706c 6169 6e5f 5f38 4c50 4f62 6a65 6374 4650 6300 5f5f 5f63
2611400 745f 5f38 4669 6c65 556e 6974 4650 6300 5f67 6574 5072 6f70 5f5f 374e 4f62 6a65 6374 4650 6369 005f 5f5f 6374 5f5f 3665
2611460 6e74 6974 7946 7600 5f69 6e4f 7264 6572 5f5f 364f 626a 6563 7446 5036 4f62 6a65 6374 002f 686f 6d65 2f6f 7361 7331 2f61
2611540 2f61 622f 7372 632f 6e65 776f 626a 6563 7473 2f70 726f 672f 432b 2b2e 3139 3239 342f 0041 6c6c 426c 6f63 6b73 2e63 0041
2611620 6c6c 426c 6f63 6b73 2e63 7878 0069 6e74 3a74 2830 2c31 293d 7228 302c 3129 3b2d 3231 3437 3438 3336 3438 3b32 3134 3734
```

```
2611700 3833 3634 373b 0063 6861 723a 7428 302c 3229 3172 2830 2c32 293b 303b 3132 373b 006c 6f6e 673a 7428 302c 3329 3d72 2830
2611760 2c31 293b 2d32 3134 3734 3833 3634 383b 3231 3437 3438 3336 3437 3b00 7368 6f72 743a 7428 302c 3429 3d72 2830 2c31 293b
2612040 2d33 3237 3638 3b33 3237 3637 3b00 756e 7369 676e 6564 2063 6361 723a 7428 302c 3529 3d72 2830 2c31 293b 303b 3235 353b
2612120 0075 6e73 6967 6e65 6420 7368 6f72 743a 7428 302c 3629 3d72 2830 2c31 293b 303b 3635 3533 353b 0075 6e73 6967 6e65 6420
2612200 6c6f 6e67 3a74 2830 2c37 293d 7228 302c 3129 3b30 3b2d 313b 0075 6e73 6967 6e65 6420 696e 743a 7428 302c 3829 3d72 2830
2612260 2c31 293b 303b 2131 3b00 666c 6f61 743a 7428 302c 3929 3d72 2830 2c31 293b 343b 303b 0064 6f75 626c 653a 7428 302c 3130
2612340 293d 7228 302c 3129 3b38 3b30 3b00 766f 6964 3a74 2830 2c31 3129 3d28 302c 3131 2900 3f3f 3f3a 7428 302c 3132 293d 2830
2612420 2c31 2900 5f5f 7670 7470 3a74 2830 2c31 3329 3d2a 2830 2c31 3429 3d66 2830 2c31 2900 5f5f 6d70 7472 3a54 2830 2c31 3529
2612500 3d73 3864 3a28 302c 3429 2c30 2c31 363b 693a 2830 2c34 292c 3136 2c31 363b 663a 2830 2c31 3329 2c33 322c 3332 3b3b 005f
2612560 5046 565f 3a74 2830 2c31 3629 3d2a 2830 2c31 3729 3d66 2830 2c32 2900 5f50 4649 5f3a 7428 302c 3133 2900 6572 726e 6f3a
2612640 4728 302c 3129 0073 7973 5f6e 6572 723a 4728 302c 3129 0065 6e76 6972 6f6e 3a47 2830 2c31 3929 3d2a 2830 2c32 3029 3d2a
2612720 2930 2c32 2900 656e 643a 4728 302c 3129 0065 7465 7874 3a47 2830 2c31 2900 6564 6174 613a 4728 302c 3129 006f 7074 6172
2613000 673a 4728 302c 3230 2900 6f70 7469 6e64 3a47 2930 2c31 2900 6f70 7465 7272 3a47 2830 2c31 2900 7074 7264 6966 665f 743a
2613060 7428 302c 3129 0073 697a 655f 743a 7428 302c 3829 0073 7472 6561 6d70 6f73 3a74 2830 2c31 2900 7374 7265 616d 6f66 663a
2613140 7428 302c 3129 0069 6f5f 7374 6174 653a 5428 302c 3231 293d 6567 6f6f 6462 6974 5f5f 696f 5f73 7461 7465 3a30 2c65 6f66
2613220 6269 745f 5f69 6f5f 7374 6174 653a 312c 6661 696c 6269 745f 5f69 6f5f 7374 6174 653a 322c 6261 6462 6974 5f5f 696f 5f73
2613300 7461 7465 3a33 2c68 6172 6466 6169 6c5f 5f69 6f5f 7374 6174 653a 342c 3b00 6f70 656e 5f6d 6f64 653a 5428 302c 3232 293d
2613360 6569 6e5f 5f6f 7065 6e5f 6d6f 6465 3a30 2c6f 7574 5f5f 6f70 656e 5f6d 6f64 653a 312c 6174 655f 5f6f 7065 6e5f 6d6f 6465
2613440 3a32 2c61 7070 5f5f 6f70 656e 5f6d 6f64 653a 332c 7472 756e 635f 5f6f 7065 6e5f 6d6f 6465 3a34 2c6e 6f63 7265 6174 655f
2613520 5f6f 7065 6e5f 616f 6465 3a35 2c6e 6f72 6570 6c61 6365 5f5f 6f70 656e 5f6d 6f64 653a 362c 3b00 7365 656b 5f64 6972 3a54
2613600 2830 2c32 3329 3165 6265 675f 5f73 6565 6b5f 6469 723a 302c 6375 725f 5f73 6565 6b5f 6469 723a 312c 656e 645f 5f73 6565
2613660 6b5f 6469 723a 322c 3b00 5f5f 4531 3a54 2830 2c32 3429 3d65 736b 6970 7773 5f5f 5f5f 4531 3a30 2c6c 6566 745f 5f5f 5f45
2613740 313a 312c 7269 6768 745f 5f5f 5f45 313a 322c 696e 7465 726e 616c 5f5f 5f5f 4531 3a33 2c64 6563 5f5f 5f5f 4531 3a34 2c6f
2614020 6374 5f5f 5f5f 4531 3a35 2c68 6578 5f5f 5f5f 4531 3a36 2c73 686f 7762 6173 655f 5f5f 5f45 313a 372c 5c00 7368 6f77 706f
2614100 696e 745f 5f5f 5f45 313a 382c 7570 7065 7263 6173 655f 5f5f 5f45 313a 392c 7368 6f77 706f 735f 5f5f 5f45 313a 3130 2c73
2614160 6369 656e 7469 6669 635f 5f5f 5f45 313a 3131 2c66 6978 6564 5f5f 5f5f 4531 3a31 322c 756e 6974 6275 665f 5f5f 5f45 313a
2614240 3133 2c73 7464 696f 5f5f 5f5f 4531 3a31 342c 3b00 5f5f 4532 3a54 2830 2c32 3529 3d65 736b 6970 7069 6e67 5f5f 5f5f 4532
2614320 3a30 2c74 6965 645f 5f5f 5f45 323a 312c 3b00 696f 733a 5428 302c 3236 293d 7336 306e 7573 6572 5f5f 3369 6f73 3a28 302c
2614400 3129 2c30 2c33 323b 795f 7573 6572 5f5f 3369 6f73 3a28 302c 3330 293d 2a28 302c 3237 293d 7875 696f 735f 7573 6572 5f75
2614460 6e69 6f6e 3a2c 3332 2c33 323b 6270 5f5f 3369 6f73 3a28 302c 3331 293d 2a28 302c 3238 293d 7873 7374 7265 616d 6275 663a
2614540 2c36 342c 3332 3b73 7461 7465 5f5f 3369 6f73 3a28 302c 3129 2c39 362c 3332 3b69 7370 6563 6961 6c5f 5f33 696f 733a 2830
2614620 2c31 292c 3132 392c 3332 3b6f 7370 6563 6961 6c5f 5f33 696f 733a 2830 2c31 292c 3136 302c 3332 3b69 7366 785f 7370 6563
2614700 6961 6c5f 5f33 696f 733a 2830 2c31 292c 3139 322c 3332 3b6f 7366 785f 7370 6563 6961 6c5f 5f33 696f 733a 2830 2c31 292c
2614760 3232 342c 3332 3b5c 0064 656c 6275 665f 5f33 696f 733a 2830 2c31 292c 3235 362c 3332 3b78 5f74 6965 5f5f 3369 6f73 3a28
2615040 302c 3332 293d 2a28 302c 3239 293d 7873 6f73 7472 6561 6d3a 2c32 3838 2c33 323b 785f 666c 6167 735f 5f33 696f 733a 2830
2615120 2c31 292c 3332 302c 3332 3b78 5f70 7265 6369 7369 6f6e 5f5f 3369 6f73 3a28 302c 3429 2c33 3532 2c31 363b 785f 6669 6c6c
2615200 5f5f 3369 6f73 3a28 302c 3229 2c33 3638 2c38 3b78 5f77 6964 7468 5f5f 3369 6f73 3a28 302c 3429 2c33 3834 2c31 363b 6173
2615260 7369 676e 5f70 7269 7661 7465 5f5f 3369 6f73 3a28 302c 3129 2c34 3136 2c33 323b 5f5f 7670 7472 5f5f 3369 6f73 3a28 302c
2615340 3333 293d 2a28 302c 3135 292c 3434 382c 3332 3b3b 0062 6173 6566 6965 6c64 5f5f 3369 6f73 3a47 2830 2c31 2900 6164 6a75
2615420 7374 6669 656c 645f 5f33 696f 733a 4728 302c 3129 0066 6c6f 6174 6669 656c 645f 5f33 696f 733a 4728 302c 3129 006e 6578
2615500 7462 6974 5f5f 3369 6f73 3a47 2830 2c31 2900 6e65 7874 776f 7264 5f5f 3369 6f73 3a47 2830 2c31 2900 7374 6469 6f66 6c75
2615560 7368 5f5f 3369 6f73 3a47 2830 2c31 3629 0069 6f73 3a5a 6369 6f73 3b3b 5f5f 6374 5f5f 3369 6f73 4650 3973 7472 6561 6d62
2615640 7566 205f 5f63 745f 5f33 696f 7346 7620 5f5f 6374 5f5f 3369 6f73 4652 3369 6f73 205f 5f64 745f 5f33 696f 7346 7620 666c
2615720 6167 735f 5f33 696f 7346 7620 666c 6167 735f 5f33 696f 7346 6c20 7365 7466 5f5f 3369 6f73 466c 5431 2073 6574 665f 5f33
2616000 696f 7346 6c20 756e 7365 7466 5f5f 3369 6f73 466c 2077 6964 7468 5f5f 3369 6f73 4676 2077 6964 7468 5f5f 3369 6f73 4669
2616060 2074 6965 5f5f 3369 6f73 4650 376f 7374 7265 616d 205c 0074 6965 5f5f 3369 6f73 4676 2066 696c 6c5f 5f33 696f 7346 6320
2616140 6669 6c6c 5f5f 3369 6f73 4676 2070 7265 6369 7369 6f6e 5f5f 3369 6f73 4669 2070 7265 6369 7369 6f6e 5f5f 3369 6f73 4676
2616220 2072 6473 7461 7465 5f5f 3369 6f73 4676 205f 5f6f 7050 765f 5f33 696f 7346 7620 5f5f 6e74 5f5f 3369 6f73 4676 2065 6f66
2616300 5f5f 3369 6f73 4676 2066 6169 6c5f 5f33 696f 7346 7620 6261 645f 5f33 696f 7346 7620 676f 6f64 5f5f 3369 6f73 4676 2063
2616360 6c65 6172 5f5f 3369 6f73 4669 2072 6462 7566 5f5f 3369 6f73 4676 205c 0069 776f 7264 5f5f 3369 6f73 4669 2070 776f 7264
2616440 5f5f 3369 6f73 4669 2062 6974 616c 6c6f 635f 5f33 696f 7353 4676 2078 616c 6c6f 635f 5f33 696f 7353 4676 2075 7265 7369
2616520 7a65 5f5f 3369 6f73 4669 2073 796e 635f 7769 7468 5f73 7464 696f 5f5f 3369 6f73 5346 7620 7365 7473 7461 7465 5f5f 3369
2616600 6f73 4669 2069 6e69 745f 5f33 696f 7346 5039 7374 7265 616d 6275 6620 5f5f 6173 5f5f 3369 6f73 4652 3369 6f73 2073 6b69
2616660 705f 5f33 696f 7346 6920 3b62 6173 6566 6965 6c64 5f5f 3369 6f73 205c 0061 646a 7573 7466 6965 6c64 5f5f 3369 6f73 2066
2616740 6c6f 6174 6669 656c 645f 5f33 696f 7320 6e65 7874 6269 745f 5f33 696f 7320 6e65 7874 776f 7264 5f5f 3369 6f73 2073 7464
```

```
2617020 696f 666c 7573 685f 5f33 696f 7320 3b3b 0073 7472 6561 6d62 7566 3a54 2830 2c32 3829 3d73 3430 616c 6c6f 635f 5f39 7374
2617100 7265 616d 6275 663a 2830 2c34 292c 302c 3136 3b78 5f75 6e62 7566 5f5f 3973 7472 6561 6d62 7566 3a28 302c 3429 2c31 362c
2617160 3136 3b78 5f62 6173 655f 5f39 7374 7265 616d 6275 663a 2830 2c32 3029 2c33 322c 3332 3b78 5f70 6261 7365 5f5f 3973 7472
2617240 6561 6d62 7566 3a28 302c 3230 292c 3634 2c33 323b 785f 7070 7472 5f5f 3973 7472 6561 6d62 7566 3a28 302c 3230 292c 3936
2617320 2c33 323b 785f 6570 7074 725f 5f39 7374 7265 616d 6275 663a 2830 2c32 3029 2c31 3238 2c33 323b 785f 6770 7472 5f5f 3973
2617400 7472 6561 6d62 7566 3a28 302c 3230 292c 3136 302c 3332 3b78 5f65 6770 7472 5f5f 3973 7472 6561 6d62 7566 3a28 302c 3230
2617460 292c 3139 322c 3332 3b5c 0078 5f65 6261 636b 5f5f 3973 7472 6561 6d62 7566 3a28 302c 3230 292c 3232 342c 3332 3b78 5f62
2617540 6c65 6e5f 5f39 7374 7265 616d 6275 663a 2830 2c31 292c 3235 362c 3332 3b5f 5f76 7074 725f 5f39 7374 7265 616d 6275 663a
2617620 2830 2c33 3329 2c32 3838 2c33 323b 3b00 7374 7265 616d 6275 663a 5a63 7374 7265 616d 6275 663b 3b5f 5f63 745f 5f39 7374
2617700 7265 616d 6275 6646 5239 7374 7265 616d 6275 6620 5f5f 6374 5f5f 3973 7472 6561 6d62 7566 4676 205f 5f63 745f 5f39 7374
2617760 7265 616d 6275 6646 5063 6920 5f5f 6374 5f5f 3973 7472 6561 6d62 7566 4650 6369 5432 205f 5f61 735f 5f39 7374 7265 616d
2620040 6275 6646 5239 7374 7265 616d 6275 6620 6462 705f 5f39 7374 7265 616d 6275 6646 7620 6261 7365 5f5f 3973 7472 6561 6d62
2620120 7566 4676 2070 6261 7365 5f5f 3973 7472 6561 6d62 7566 4676 205c 0070 7074 725f 5f39 7374 7265 616d 6275 6646 7620 6570
2620200 7074 725f 5f39 7374 7265 616d 6275 6646 7620 6770 7472 5f5f 3973 7472 6561 6d62 7566 4676 2065 6770 7472 5f5f 3973 7472
2620260 6561 6d62 7566 4676 2065 6261 636b 5f5f 3973 7472 6561 6d62 7566 4676 2065 6275 665f 5f39 7374 7265 616d 6275 6646 7620
2620340 626c 656e 5f5f 3973 7472 6561 6162 7566 4676 2073 6574 705f 5f39 7374 7265 616d 6275 6646 5063 5431 2073 6574 675f 5f39
2620420 7374 7265 616d 6275 6646 5063 4e32 3120 7062 756d 705f 5f39 7374 7265 616d 6275 6646 6920 5c00 6762 756d 705f 5f39 7374
2620500 7265 616d 6275 6646 6920 7365 7462 5f5f 3973 7472 6561 6d62 7566 4650 6354 3169 2075 6e62 7566 6665 7265 645f 5f39 7374
2620560 7265 616d 6275 6646 7620 756e 6275 6666 6572 6564 5f5f 3973 7472 6561 6d62 7566 4669 2061 6c6c 6f63 6174 655f 5f39 7374
2620640 7265 616d 6275 6646 7620 646f 616c 6c6f 6361 7465 5f5f 3973 7472 6561 6d62 7566 4676 206f 7665 7266 6c6f 775f 5f39 7374
2620720 7265 616d 6275 6646 6920 756e 6465 7266 6c6f 775f 5f39 7374 7265 616d 6275 6646 7620 5c00 7062 6163 6b66 6169 6c5f 5f39
2621000 7374 7265 616d 6275 6646 6920 7379 6e63 5f5f 3973 7472 6561 6d62 7566 4676 2073 6565 6b6f 6666 5f5f 3973 7472 6561 6d62
2621060 7566 466c 3873 6565 6b5f 6469 7269 2073 6565 6b70 6f73 5f5f 3973 7472 6561 6d62 7566 466c 6920 7873 7075 746e 5f5f 3973
2621140 7472 6561 6d62 7566 4650 4363 6920 7873 6765 746e 5f5f 3973 7472 6561 6d62 7566 4650 6369 2069 6e5f 6176 6169 6c5f 5f39
2621220 7374 7265 616d 6275 6646 7620 6f75 745f 7761 6974 696e 675f 5f39 7374 7265 616d 6275 6646 7620 5c00 7367 6574 635f 5f39
2621300 7374 7265 616d 6275 6646 7620 736e 6578 7463 5f5f 3973 7472 6561 6d62 7566 4676 2073 6275 6d70 635f 5f39 7374 7265 616d
2621360 6275 6646 7620 7374 6f73 7363 5f5f 3973 7472 6561 6d62 7566 4676 2073 7075 7462 6163 6b63 5f5f 3973 7472 6561 6d62 7566
2621440 4663 2073 7075 7463 5f5f 3973 7472 6561 6d62 7566 4669 2073 7075 746e 5f5f 3973 7472 6561 6d62 7566 4650 4363 6920 7367
2621520 6574 6e5f 5f39 7374 7265 616d 6275 6646 5063 6920 7365 7462 7566 5f5f 3973 7472 6561 6d62 7566 4650 6369 205c 0073 6574
2621600 6275 665f 5f39 7374 7265 616d 6275 6646 5055 6369 2073 6574 6275 665f 5f39 7374 7265 616d 6275 6646 5063 6954 3220 5f5f
2621660 6474 5f5f 3973 7472 6561 6d62 7566 4676 2078 5f73 6e65 7874 635f 5f39 7374 7265 616d 6275 6646 7620 3b3b 3b00 6973 7472
2621740 6561 6d3a 5428 302c 3334 293d 7337 3278 5f67 636f 756e 745f 5f37 6973 7472 6561 6d3a 2830 2c31 292c 302c 3332 3b5f 5f76
2622020 7374 725f 5f37 6973 7472 6561 6d3a 2830 2c33 3329 2c33 322c 3332 3b50 696f 733a 2830 2c33 3529 3d2a 2830 2c32 3629 2c36
2622100 342c 3332 3b4f 696f 733a 2830 2c32 3629 2c39 362c 3438 303b 3b00 6973 7472 6561 6d3a 5a63 6973 7472 6561 6d3b 696f 733b
2622160 5f5f 6374 5f5f 3769 7374 7265 616d 4650 3973 7472 6561 6d62 7566 205f 5f63 745f 5f37 6973 7472 6561 6d46 7620 5f5f 6374
2622240 5f5f 3769 7374 7265 616d 4650 3973 7472 6561 6d62 7566 6950 376f 7374 7265 616d 205f 5f63 745f 5f37 6973 7472 6561 6d46
2622320 6950 6354 3120 5f5f 6374 5f5f 3769 7374 7265 616d 4669 5431 5037 6f73 7472 6561 6d20 5f5f 6374 5f5f 3769 7374 7265 616d
2622400 4652 3769 7374 7265 616d 205f 5f64 745f 5f37 6973 7472 6561 6d46 7620 5c00 6970 6678 5f5f 3769 7374 7265 616d 4669 2069
2622460 7366 785f 5f37 6973 7472 6561 6d46 7620 7365 656b 675f 5f37 6973 7472 6561 6d46 6c20 7365 656b 675f 5f37 6973 7472 6561
2622540 6d46 6c38 7365 656b 5f64 6972 2074 656c 6c67 5f5f 3769 7374 7265 616d 4676 205f 5f72 735f 5f37 6973 7472 6561 6d46 5046
2622620 5237 6973 7472 6561 6d5f 5237 6973 7472 6561 6d20 5f5f 7273 5f5f 3769 7374 7265 616d 4650 4652 3369 6f73 5f52 3369 6f73
2622700 205f 5f72 735f 5f37 6973 7472 6561 6d46 5063 205f 5f72 735f 5f37 6973 7472 6561 6d46 5055 6320 5c00 5f5f 7273 5f5f 3769
2622760 7374 7265 616d 4652 5563 205f 5f72 735f 5f37 6973 7472 6561 6d46 5263 205f 5f72 735f 5f37 6973 7472 6561 6d46 5273 205f
2623040 5f72 735f 5f37 6973 7472 6561 6d46 5269 205f 5f72 735f 5f37 6973 7472 6561 6d46 526c 205f 5f72 735f 5f37 6973 7472 6561
2623120 6d46 5255 7320 5f5f 7273 5f5f 3769 7374 7265 616d 4652 5569 205f 5f72 735f 5f37 6973 7472 6561 6d46 5255 6c20 5f5f 7273
2623200 5f5f 3769 7374 7265 616d 4652 6620 5f5f 7273 5f5f 3769 7374 7265 616d 4652 6420 5f5f 7273 5f5f 3769 7374 7265 616d 4650
2623260 3973 7472 6561 6462 7566 205c 0067 6574 5f5f 3769 7374 7265 616d 4650 6369 6320 6765 745f 5f37 6973 7472 6561 6d46 5055
2623340 6369 6320 6765 745f 5f37 6973 7472 6561 6d46 5239 7374 7265 616d 6275 6663 2067 6574 5f5f 3769 7374 7265 616d 4652 5563
2623420 2067 6574 5f5f 3769 7374 7265 616d 4652 6320 6765 745f 5f37 6973 7472 6561 6d46 7620 6765 746c 696e 655f 5f37 6973 7472
2623500 6561 6d46 5063 6963 2067 6574 6c69 6e65 5f5f 3769 7374 7265 616d 4650 5563 6963 2070 6565 6b5f 5f37 6973 7472 6561 6d46
2623560 7620 6967 6e6f 7265 5f5f 3769 7374 7265 616d 4669 5431 205c 0072 6561 645f 5f37 6973 7472 6561 6d46 5063 6920 7265 6164
2623640 5f5f 3769 7374 7265 616d 4650 5563 6920 6763 6f75 6e74 5f5f 3769 7374 7265 616d 4676 2070 7574 6261 636b 5f5f 3769 7374
2623720 7265 616d 4663 2073 796e 635f 5f37 6973 7472 6561 6d46 7620 646f 5f69 7066 785f 5f37 6973 7472 6561 6d46 6920 6561 7477
2624000 6869 7465 5f5f 3769 7374 7265 616d 4676 2078 6765 745f 5f37 6973 7472 6561 6d46 5063 203b 3b3b 006f 7374 7265 616d 3a54
2624060 2830 2c32 3929 3d73 3638 5f5f 7670 7472 5f5f 376f 7374 7265 616d 3a28 302c 3333 292c 302c 3332 3b50 696f 733a 2830 2c33
```

| | | | | | | | | | | | | | | | | | | | | | | | | |
|---|---|---|---|---|---|---|---|---|---|---|---|---|---|---|---|---|---|---|---|---|---|---|---|---|
| 2624140 | 3529 | 2c33 | 322c | 3332 | 3b4f | 696f | 733a | 2830 | 2c32 | 3629 | 2c36 | 342c | 3438 | 303b | 3b00 | 6f73 | 7472 | 6561 | 6d3a | 5a63 | 6f73 | 7472 | 6561 | 6d3b |
| 2624220 | 696f | 733b | 5f5f | 6374 | 5f5f | 376f | 7374 | 7265 | 616d | 4650 | 3973 | 7472 | 6561 | 6d62 | 7566 | 205f | 5f63 | 745f | 5f37 | 6f73 | 7472 | 6561 | 6d46 | 7620 |
| 2624300 | 5f5f | 6374 | 5f5f | 376f | 7374 | 7265 | 616d | 4669 | 205f | 5f63 | 745f | 5f37 | 6f73 | 7472 | 6561 | 6d46 | 6950 | 6320 | 5f5f | 6374 | 5f5f | 376f | 7374 | 7265 |
| 2624360 | 616d | 4652 | 376f | 7374 | 7265 | 616d | 205f | 5f64 | 745f | 5f37 | 6f73 | 7472 | 6561 | 6d46 | 7620 | 6f70 | 6678 | 5f5f | 376f | 7374 | 7265 | 616d | 4676 | 206f |
| 2624440 | 7366 | 785f | 5f37 | 6f73 | 7472 | 6561 | 6d46 | 7620 | 666c | 7573 | 685f | 5f37 | 6f73 | 7472 | 6561 | 6d46 | 7620 | 5c00 | 7365 | 656b | 705f | 5f37 | 6f73 | 7472 |
| 2624520 | 6561 | 6d46 | 6c20 | 7365 | 656b | 705f | 5f37 | 6f73 | 7472 | 6561 | 6d46 | 6c38 | 7365 | 656b | 5f64 | 6972 | 2074 | 656c | 6c70 | 5f5f | 376f | 7374 | 7265 | 616d |
| 2624600 | 4676 | 2070 | 7574 | 5f5f | 376f | 7374 | 7265 | 616d | 4663 | 205f | 5f6c | 735f | 5f37 | 6f73 | 7472 | 6561 | 6d46 | 6320 | 5f5f | 6c73 | 5f5f | 376f | 7374 | 7265 |
| 2624660 | 616d | 4655 | 6320 | 5f5f | 6c73 | 5f5f | 376f | 7374 | 7265 | 616d | 4650 | 4363 | 205f | 5f6c | 735f | 5f37 | 6f73 | 7472 | 6561 | 6d46 | 6920 | 5f5f | 6c73 | 5f5f |
| 2624740 | 376f | 7374 | 7265 | 616d | 466c | 205f | 5f6c | 735f | 5f37 | 6f73 | 7472 | 6561 | 6d46 | 6420 | 5f5f | 6c73 | 5f5f | 376f | 7374 | 7265 | 616d | 4666 | 205c | 005f |
| 2625020 | 5f6c | 735f | 5f37 | 6f73 | 7472 | 6561 | 6d46 | 5569 | 205f | 5f6c | 735f | 5f37 | 6f73 | 7472 | 6561 | 6d46 | 556c | 205f | 5f6c | 735f | 5f37 | 6f73 | 7472 | 6561 |
| 2625100 | 6d46 | 5076 | 205f | 5f6c | 735f | 5f37 | 6f73 | 7472 | 6561 | 6d46 | 5039 | 7374 | 7265 | 616d | 6275 | 6620 | 5f5f | 6c73 | 5f5f | 376f | 7374 | 7265 | 616d | 4673 |
| 2625160 | 205f | 5f5c | 735f | 5f37 | 6f73 | 7472 | 6561 | 6d46 | 5573 | 205f | 5f6c | 735f | 5f37 | 6f73 | 7472 | 6561 | 6d46 | 5046 | 5237 | 6f73 | 7472 | 6561 | 6d5f | 5237 |
| 2625240 | 6f73 | 7472 | 6561 | 6420 | 5f5f | 6c73 | 5f5f | 376f | 7374 | 7265 | 616d | 4650 | 4652 | 3369 | 6f73 | 5f52 | 3369 | 6f73 | 2077 | 7269 | 7465 | 5f5f | 376f | 7374 |
| 2625320 | 7265 | 616d | 4650 | 4363 | 6920 | 5c00 | 7772 | 6974 | 655f | 5f37 | 6f73 | 7472 | 6561 | 6d46 | 5043 | 5563 | 6920 | 646f | 5f6f | 7066 | 785f | 5f37 | 6f73 | 7472 |
| 2625400 | 6561 | 6d46 | 7620 | 646f | 5f6f | 7366 | 785f | 5f37 | 6f73 | 7472 | 6561 | 6d46 | 7620 | 3b3b | 3b00 | 7075 | 745f | 5f37 | 6f73 | 7472 | 6561 | 6d46 | 633a | 6628 |
| 2625460 | 302c | 3336 | 293d | 2a28 | 302c | 3239 | 2900 | 5f5f | 3074 | 6869 | 733a | 7028 | 302c | 3336 | 2900 | 5f5f | 3063 | 3a70 | 2830 | 2c32 | 2900 | 2f75 | 7372 | 2f43 |
| 2625540 | 432f | 7375 | 6e34 | 2f69 | 6e63 | 6c2f | 696f | 7374 | 7265 | 616d | 2e68 | 005f | 5f30 | 7468 | 6973 | 3a72 | 2830 | 2c33 | 3629 | 005f | 5f30 | 7468 | 6973 | 203a |
| 2625620 | 5a74 | 6c00 | 5f5f | 3363 | 203a | 5a74 | 6c00 | 7075 | 745f | 5f37 | 6f73 | 7472 | 6561 | 6d46 | 6320 | 3a5a | 7446 | 0069 | 6f73 | 7472 | 6561 | 6d3a | 5428 | 302c |
| 2625700 | 3337 | 293d | 7338 | 3078 | 5f67 | 636f | 756e | 745f | 5f37 | 6973 | 7472 | 6561 | 6d3a | 2830 | 2c31 | 292c | 302c | 3332 | 3b5f | 5f76 | 7074 | 725f | 5f37 | 6973 |
| 2625760 | 7472 | 6561 | 6d3a | 2330 | 2c33 | 3329 | 2c33 | 322c | 3332 | 3b50 | 696f | 733a | 2830 | 2c33 | 3529 | 2c36 | 342c | 3332 | 3b4f | 6f73 | 7472 | 6561 | 6d3a | 2830 |
| 2626040 | 2c32 | 3929 | 2c39 | 362c | 3534 | 343b | 3b00 | 696f | 7374 | 7265 | 616d | 3a5a | 6369 | 6f73 | 7472 | 6561 | 6d3b | 6973 | 7472 | 6561 | 6d20 | 6f73 | 7472 | 6561 |
| 2626120 | 6d20 | 696f | 733b | 5f5f | 6374 | 5f5f | 3869 | 6f73 | 7472 | 6561 | 6d46 | 5039 | 7374 | 7265 | 616d | 6275 | 6620 | 5f5f | 6374 | 5f5f | 3869 | 6f73 | 7472 | 6561 |
| 2626200 | 6d46 | 7620 | 5f5f | 6374 | 5f5f | 3869 | 6f73 | 7472 | 6561 | 6d46 | 5238 | 696f | 7374 | 7265 | 616d | 205f | 5f64 | 745f | 5f38 | 696f | 7374 | 7265 | 616d | 4676 |
| 2626260 | 203b | 3b3b | 0063 | 696e | 3a47 | 2830 | 2c33 | 3829 | 3d78 | 7369 | 7374 | 7265 | 616d | 5f77 | 6974 | 6861 | 7373 | 6967 | 6e3a | 0063 | 6f75 | 743a | 4728 | 302c |
| 2626340 | 3339 | 293d | 7873 | 6f73 | 7472 | 6561 | 645f | 7769 | 7468 | 6173 | 7369 | 676e | 3a00 | 6365 | 7272 | 3a47 | 2830 | 2c33 | 3929 | 0063 | 6c6f | 673a | 4728 | 302c |
| 2626420 | 3339 | 2900 | 496f | 7374 | 7265 | 616d | 5f69 | 6e69 | 743a | 5428 | 302c | 3430 | 293d | 7331 | 5f5f | 5739 | 5f5f | 3133 | 496f | 7374 | 7265 | 616d | 5f69 | 6e69 |
| 2626500 | 743a | 2830 | 2c32 | 292c | 302c | 383b | 3b00 | 7374 | 6473 | 7461 | 7475 | 735f | 5f31 | 3349 | 6f73 | 7472 | 6561 | 6d5f | 696e | 6974 | 3a47 | 2830 | 2c31 | 2900 |
| 2626560 | 696e | 6974 | 636f | 756e | 745f | 5f31 | 3349 | 6f73 | 7472 | 6561 | 645f | 696e | 6974 | 3a47 | 2830 | 2c31 | 2900 | 496f | 7374 | 7265 | 616d | 5f69 | 6e69 | 743a |
| 2626640 | 5a63 | 496f | 7374 | 7265 | 616d | 5f69 | 6e69 | 743b | 3b5f | 5f63 | 745f | 5f31 | 3349 | 6f73 | 7472 | 6561 | 6d5f | 696e | 6974 | 4676 | 205f | 5f64 | 745f | 5f31 |
| 2626720 | 3349 | 6f73 | 7472 | 6561 | 6d5f | 696e | 6974 | 4676 | 203b | 7374 | 6473 | 7461 | 7475 | 735f | 5f31 | 3349 | 6f73 | 7472 | 6561 | 6d5f | 696e | 6974 | 2069 | 6e69 |
| 2627000 | 7463 | 6f75 | 6e74 | 5f5f | 3133 | 496f | 7374 | 7265 | 616d | 5f69 | 6e69 | 7420 | 3b40 | 696f | 733b | 0069 | 6f73 | 7472 | 6561 | 6d5f | 696e | 6974 | 3a53 | 2830 |
| 2627060 | 2c34 | 3029 | 0047 | 5054 | 3a74 | 2830 | 2c31 | 3329 | 0073 | 6161 | 6e69 | 705f | 696e | 743a | 5428 | 302c | 3431 | 293d | 7338 | 6663 | 745f | 5f31 | 3073 | 6d61 |
| 2627140 | 6e69 | 705f | 696e | 743a | 2830 | 2c34 | 3229 | 3d2a | 2830 | 2c34 | 3329 | 3d66 | 2830 | 2c33 | 3529 | 2c30 | 2c33 | 323b | 6172 | 675f | 5f31 | 3073 | 6d61 | 6e69 |
| 2627220 | 705f | 696e | 743a | 2830 | 2c31 | 292c | 3332 | 2c33 | 323b | 3b00 | 736d | 616e | 6970 | 5f69 | 6e74 | 3a5a | 6373 | 6d61 | 6e69 | 705f | 696e | 743b | 3b5f | 5f63 |
| 2627300 | 745f | 5f31 | 3073 | 6161 | 6e69 | 705f | 696e | 7446 | 5046 | 5233 | 696f | 7369 | 5f52 | 3369 | 6f73 | 6920 | 3b3b | 5f5f | 6c73 | 5f5f | 4652 | 376f | 7374 | 7265 |
| 2627360 | 616d | 5231 | 3073 | 6461 | 6e69 | 705f | 696e | 7420 | 5f5f | 7273 | 5f5f | 4652 | 3769 | 7374 | 7265 | 616d | 5231 | 3073 | 6d61 | 6e69 | 705f | 696e | 7420 | 3b00 |
| 2627440 | 7361 | 7070 | 6c79 | 5f69 | 6e74 | 3a54 | 2830 | 2c34 | 3429 | 3d73 | 3466 | 6374 | 5f5f | 3130 | 7361 | 7070 | 6c79 | 5f69 | 6e74 | 3a28 | 302c | 3432 | 292c | 302c |
| 2627520 | 3332 | 3b3b | 0073 | 6170 | 706c | 795f | 696e | 743a | 5a63 | 7361 | 7070 | 6c79 | 5f69 | 6e74 | 3b3b | 5f5f | 6374 | 5f5f | 3130 | 7361 | 7070 | 6c79 | 5f69 | 6e74 |
| 2627600 | 4650 | 4652 | 3369 | 6f73 | 695f | 5233 | 696f | 7320 | 5f5f | 636c | 5f5f | 3130 | 7361 | 7070 | 6c79 | 5f69 | 6e74 | 4669 | 203b | 3b3b | 0069 | 6d61 | 6e69 | 705f |
| 2627660 | 696e | 743a | 5428 | 302c | 3435 | 293d | 7338 | 6663 | 745f | 5f31 | 3069 | 6d61 | 6e69 | 705f | 696e | 743a | 2830 | 2c34 | 3629 | 3d2a | 2830 | 2c34 | 3729 | 3d66 |
| 2627740 | 2830 | 2c34 | 3829 | 3d2a | 2830 | 2c33 | 3429 | 2c30 | 2c33 | 323b | 6172 | 675f | 5f31 | 3069 | 6d61 | 6e69 | 705f | 696e | 743a | 2830 | 2c31 | 292c | 3332 | 2c33 |
| 2630020 | 323b | 3b00 | 696d | 616e | 6970 | 5f69 | 6e74 | 3a5a | 6369 | 6161 | 6e69 | 705f | 696e | 743b | 3b5f | 5f63 | 745f | 5f31 | 3069 | 6d61 | 6e69 | 705f | 696e | 7446 |
| 2630100 | 5046 | 5237 | 6973 | 7472 | 6561 | 6d69 | 5f52 | 3769 | 7374 | 7265 | 616d | 6920 | 3b3b | 5f5f | 7273 | 5f5f | 4652 | 3769 | 7374 | 7265 | 616d | 5231 | 3069 | 6d61 |
| 2630160 | 6e69 | 705f | 696e | 7420 | 3b00 | 6961 | 7070 | 6c79 | 5f69 | 6e74 | 3a54 | 2830 | 2c34 | 3929 | 3d73 | 3466 | 6374 | 5f5f | 3130 | 6961 | 7070 | 6c79 | 5f69 | 6e74 |
| 2630240 | 3a28 | 302c | 3436 | 292c | 302c | 3332 | 3b3b | 0069 | 6170 | 706c | 795f | 696e | 743a | 5a63 | 6961 | 7070 | 6c79 | 5f69 | 6e74 | 3b3b | 5f5f | 6374 | 5f5f | 3130 |
| 2630320 | 6961 | 7070 | 6c79 | 5f69 | 6e74 | 4650 | 4652 | 3769 | 7374 | 7265 | 616d | 695f | 5237 | 6973 | 7472 | 6561 | 6d20 | 5f5f | 636c | 5f5f | 3130 | 6961 | 7070 | 6c79 |
| 2630400 | 5f69 | 6e74 | 4669 | 203b | 3b3b | 006f | 6d61 | 6e69 | 705f | 696e | 743a | 5428 | 302c | 3530 | 293d | 7338 | 6663 | 745f | 5f31 | 306f | 6d61 | 6e69 | 705f | 696e |
| 2630460 | 743a | 2830 | 2c35 | 3129 | 3d2a | 2830 | 2c35 | 3229 | 3d66 | 2830 | 2c33 | 3629 | 2c30 | 2c33 | 323b | 6172 | 675f | 5f31 | 306f | 6d61 | 6e69 | 705f | 696e | 743a |
| 2630540 | 2830 | 2c31 | 292c | 3332 | 2c33 | 323b | 3b00 | 6f6d | 616e | 6970 | 5f69 | 6e74 | 3a5a | 636f | 6d61 | 6e69 | 705f | 696e | 743b | 3b5f | 5f63 | 745f | 5f31 | 306f |
| 2630620 | 6d61 | 6e69 | 705f | 696e | 7446 | 5046 | 5237 | 6f73 | 7472 | 6561 | 6d69 | 5f52 | 376f | 7374 | 7265 | 616d | 6920 | 3b3b | 5f5f | 6c73 | 5f5f | 4652 | 376f | 7374 |
| 2630700 | 7265 | 616d | 5231 | 306f | 6d61 | 6e69 | 705f | 696e | 7420 | 3b00 | 6f61 | 7070 | 6c79 | 5f69 | 6e74 | 3a54 | 2830 | 2c35 | 3329 | 3d73 | 3466 | 6374 | 5f5f | 3130 |
| 2630760 | 6f61 | 7070 | 6c79 | 5f69 | 6e74 | 3a28 | 302c | 3531 | 292c | 302c | 3332 | 3b3b | 006f | 6170 | 706c | 795f | 696e | 743a | 5a63 | 6f61 | 7070 | 6c79 | 5f69 | 6e74 |
| 2631040 | 3b3b | 5f5f | 6374 | 5f5f | 3130 | 6f61 | 7070 | 6c79 | 5f69 | 6e74 | 4650 | 4652 | 376f | 7374 | 7265 | 616d | 695f | 5237 | 6f73 | 7472 | 6561 | 6d20 | 5f5f | 636c |
| 2631120 | 5f5f | 3130 | 6f61 | 7070 | 6c79 | 5f69 | 6e74 | 4669 | 203b | 3b3b | 0069 | 6f6d | 616e | 6970 | 5f69 | 6e74 | 3a54 | 2830 | 2c35 | 3429 | 3d73 | 3866 | 6374 | 5f5f |
| 2631200 | 3131 | 696f | 6d61 | 6e69 | 705f | 696e | 743a | 2830 | 2c35 | 3529 | 3d2a | 2830 | 2c35 | 3629 | 3d66 | 2830 | 2c35 | 3729 | 3d2a | 2830 | 2c33 | 3729 | 2c30 | 2c33 |

```
2631260 323b 6172 675f 5f31 3169 6f6d 616e 6970 5f69 6e74 3a28 302c 3129 2c33 322c 3332 3b3b 0069 6f6d 616e 6970 5f69 6e74 3a5a
2631340 6369 6f6d 616e 6970 5f69 6e74 3b3b 5f5f 6374 5f5f 3131 696f 6d61 6e69 705f 696e 7446 5046 5238 696f 7374 7265 616d 695f
2631420 5238 696f 7374 7265 616d 6920 3b3b 5f5f 6c73 5f5f 4652 3869 6f73 7472 6561 6d52 3131 696f 6461 6e69 705f 696e 7420 5f5f
2631500 7273 5f5f 4652 3869 6f73 7472 6561 6d52 3131 696f 6d61 6e69 705f 696e 7420 3b00 696f 6170 706c 795f 696e 743a 5428 302c
2631560 3538 293d 7334 6663 745f 5f31 3169 6f61 7070 6c79 5f69 6e74 3a28 302c 3535 292c 302c 3332 3b3b 0069 6f61 7070 6c79 5f69
2631640 6e74 3a5a 6369 6f61 7070 6c79 5f69 6e74 3b3b 5f5f 6374 5f5f 3131 696f 6170 706c 795f 696e 7446 5046 5238 696f 7374 7265
2631720 616d 695f 5238 696f 7374 7265 616d 205f 5f63 6c5f 5f31 3169 6f61 7070 6c79 5f69 6e74 4669 203b 3b3b 0073 6d61 6e69 705f
2632000 6c6f 6e67 3a54 2830 2c35 3929 3d73 3866 6374 5f5f 3131 736d 616e 6970 5f6c 6f6e 673a 2830 2c34 3229 2c30 2c33 323b 6172
2632060 675f 5f31 3173 6d61 6e69 705f 6c6f 6e67 3a28 302c 3129 2c33 322c 3332 3b3b 0073 6d61 6e69 705f 6c6f 6e67 3a5a 6373 6d61
2632140 6e69 705f 6c6f 6e67 3b3b 5f5f 6374 5f5f 3131 736d 616e 6970 5f6c 6f6e 6746 5046 5233 696f 736c 5f52 3369 6f73 6c20 3b3b
2632220 5f5f 6c73 5f5f 4652 376f 7374 7265 616d 5231 3173 6d61 6e69 705f 6c6f 6e67 205f 5f72 735f 5f46 5237 6973 7472 6561 6d52
2632300 3131 736d 616e 6970 5f6c 6f6e 6720 3b00 7361 7070 6c79 5f6c 6f6e 673a 5428 302c 3630 293d 7334 6663 745f 5f31 3173 6170
2632360 706c 795f 6c6f 6e67 3a28 302c 3432 292c 302c 3332 3b3b 0073 6170 706c 795f 6c6f 6e67 3a5a 6373 6170 706c 795f 6c6f 6e67
2632440 3b3b 5f5f 6374 5f5f 3131 7361 7070 6c79 5f6c 6f6e 6746 5046 5233 696f 736c 5f52 3369 6f73 205f 5f63 6c5f 5f31 3173 6170
2632520 706c 795f 6c6f 6e67 466c 203b 3b3b 0069 6d61 6e69 705f 6c6f 6e67 3a54 2830 2c36 3129 3d73 3866 6374 5f5f 3131 696d 616e
2632600 6970 5f6c 6f6e 673a 2830 2c34 3629 2c30 2c33 323b 6172 675f 5f31 3169 6d61 6e69 705f 6c6f 6e67 3a28 302c 3129 2c33 322c
2632660 3332 3b3b 0069 6d61 6e69 705f 6c6f 6e67 3a5a 6369 6d61 6e69 705f 6c6f 6e67 3b3b 5f5f 6374 5f5f 3131 696d 616e 6970 5f6c
2632740 6f6e 6746 5046 5237 6973 7472 6561 6d6c 5f52 3769 7374 7265 616d 6c20 3b3b 5f5f 7273 5f5f 4652 3769 7374 7265 616d 5231
2633020 3169 6d61 6e69 705f 6c6f 6e67 203b 0069 6170 706c 795f 6c6f 6e67 3a54 2830 2c36 3229 3d73 3466 6374 5f5f 3131 6961 7070
2633100 6c79 5f6c 6f6e 673a 2830 2c34 3629 2c30 2c33 323b 3b00 6961 7070 6c79 5f6c 6f6e 673a 5a63 6961 7070 6c79 5f6c 6f6e 673b
2633160 3b5f 5f63 745f 5f31 3169 6170 706c 795f 6c6f 6e67 4650 4652 3769 7374 7265 616d 6c5f 5237 6973 7472 6561 6d20 5f5f 636c
2633240 5f5f 3131 6961 7070 6c79 5f6c 6f6e 6746 6c20 3b3b 3b00 6f6d 616e 6970 5f6c 6f6e 673a 5428 302c 3633 293d 7338 6663 745f
2633320 5f31 316f 6d61 6e69 705f 6c6f 6e67 3a28 302c 3531 292c 302c 3332 3b61 7267 5f5f 3131 6f6d 616e 6970 5f6c 6f6e 673a 2830
2633400 2c31 292c 3332 2c33 323b 3b00 6f6d 616e 6970 5f6c 6f6e 673a 5a63 6f6d 616e 6970 5f6c 6f6e 673b 3b5f 5f63 745f 5f31 316f
2633460 6d61 6e69 705f 6c6f 6e67 4650 4652 376f 7374 7265 616d 6c5f 5237 6f73 7472 6561 6d6c 203b 3b5f 5f6c 735f 5f46 5237 6f73
2633540 7472 6561 6d52 3131 6f6d 616e 6970 5f6c 6f6e 6720 3b00 6f61 7070 6c79 5f6c 6f6e 673a 5428 302c 3634 293d 7334 6663 745f
2633620 5f31 316f 6170 706c 795f 6c6f 6e67 3a28 302c 3531 292c 302c 3332 3b3b 006f 6170 706c 795f 6c6f 6e67 3a5a 636f 6170 706c
2633700 795f 6c6f 6e67 3b3b 5f5f 6374 5f5f 3131 6f61 7070 6c79 5f6c 6f6e 6746 5046 5237 6f73 7472 6561 6d6c 5f52 376f 7374 7265
2633760 616d 205f 5f63 6c5f 5f31 316f 6170 706c 795f 6c6f 6e67 466c 203b 3b3b 0069 6f6d 616e 6970 5f6c 6f6e 673a 5428 302c 3635
2634040 293d 7338 6663 745f 5f31 3269 6f6d 616e 6970 5f6c 6f6e 673a 2830 2c35 3529 2c30 2c33 323b 6172 675f 5f31 3269 6f6d 616e
2634120 6970 5f6c 6f6e 673a 2830 2c31 292c 3332 2c33 323b 3b00 696f 6d61 6e69 705f 6c6f 6e67 3a5a 6369 6f6d 616e 6970 5f6c 6f6e
2634200 673b 3b5f 5f63 745f 5f31 3269 6f6d 616e 6970 5f6c 6f6e 6746 5046 5238 696f 7374 7265 616d 6c5f 5238 696f 7374 7265 616d
2634260 6c20 3b3b 5f5f 6c73 5f5f 4652 3869 6f73 7472 6561 6d52 3132 696f 6d61 6e69 705f 6c6f 6e67 205f 5f72 735f 5f46 5238 696f
2634340 7374 7265 616d 5231 3269 6f6d 616e 6970 5f6c 6f6e 6720 3b00 696f 6170 706c 795f 6c6f 6e67 3a54 2830 2c36 3629 3d73 3466
2634420 6374 5f5f 3132 696f 6170 706c 795f 6c6f 6e67 3a28 302c 3535 292c 302c 3332 3b3b 0069 6f61 7070 6c79 5f6c 6f6e 673a 5a63
2634500 696f 6170 706c 795f 6c6f 6e67 3b3b 5f5f 6374 5f5f 3132 696f 6170 706c 795f 6c6f 6e67 4650 4652 3869 6f73 7472 6561 6d6c
2634560 5f52 3869 6f73 7472 6561 6d20 5f5f 636c 5f5f 3132 696f 6170 706c 795f 6c6f 6e67 466c 203b 3b3b 0073 7464 696f 6275 663a
2634640 5428 302c 3637 293d 7335 3261 6c6c 6f63 5f5f 3973 7472 6561 6d62 7566 3a28 302c 3429 2c30 2c31 363b 785f 756e 6275 665f
2634720 5f39 7374 7265 616d 6275 663a 2830 2c34 292c 3136 2c31 363b 785f 6261 7365 5f5f 3973 7472 6561 6d62 7566 3a28 302c 3230
2635000 292c 3332 2c33 323b 785f 7062 6173 655f 5f39 7374 7265 616d 6275 663a 2830 2c32 3029 2c36 342c 3332 3b78 5f70 7074 725f
2635060 5f39 7374 7265 616d 6275 663a 2830 2c32 3029 2c39 362c 3332 3b78 5f65 7070 7472 5f5f 3973 7472 6561 6d62 7566 3a28 302c
2635140 3230 292c 3132 382c 3332 3b78 5f67 7074 725f 5f39 7374 7265 616d 6275 663a 2830 2c32 3029 2c31 3630 2c33 323b 785f 6567
2635220 7074 725f 5f39 7374 7265 616d 6275 663a 2830 2c32 3029 2c31 3932 2c33 323b 5c00 785f 6562 6163 6b5f 5f39 7374 7265 616d
2635300 6275 663a 2830 2c32 3029 2c32 3234 2c33 323b 785f 626c 656e 5f5f 3973 7472 6561 6d62 7566 3a28 302c 3129 2c32 3536 2c33
2635360 323b 5f5f 7670 7472 5f5f 3973 7472 6561 6d62 7566 3a28 302c 3333 292c 3238 382c 3332 3b66 705f 5f38 7374 6469 6f62 7566
2635440 3a28 302c 3638 293d 2a28 302c 3138 293d 7873 5f69 6f62 7566 3a2c 3332 302c 3332 3b6c 6173 745f 6f70 5f5f 3873 7464 696f
2635520 6275 663a 2830 2c31 292c 3335 322c 3332 3b62 7566 5f5f 3873 7464 696f 6275 663a 2830 2c36 3929 3d61 7228 302c 3129 3b30
2635600 3b31 3b28 302c 3229 2c33 3834 2c31 363b 3b00 7374 6469 6f62 7566 3a5a 6373 7464 696f 6275 663b 7374 7265 616d 6275 663b
2635660 6f76 6572 666c 6f77 5f5f 3873 7464 696f 6275 6646 6920 756e 6465 7266 6c6f 775f 5f38 7374 6469 6f62 7566 4676 2073 796e
2635740 635f 5f38 7374 6469 6f62 7566 4676 2073 6565 6b6f 6666 5f5f 3873 7464 696f 6275 6646 6c38 7365 656b 5f64 6972 6920 7062
2636020 6163 6b66 6169 6c5f 5f38 7374 6469 6f62 7566 4669 205f 5f63 745f 5f38 7374 6469 6f62 7566 4650 365f 696f 6275 6620 5f5f
2636100 6374 5f5f 3873 7464 696f 6275 6646 5243 3873 7464 696f 6275 6620 5c00 7374 6469 6f66 696c 655f 5f38 7374 6469 6f62 7566
2636160 4676 205f 5f64 745f 5f38 7374 6469 6f62 7566 4676 203b 3b3b 0066 696c 6562 7566 3a54 2830 2c37 3029 3d73 3634 616c 6c6f
2636240 635f 5f39 7374 7265 616d 6275 663a 2830 2c34 292c 302c 3136 3b78 5f75 6e62 7566 5f5f 3973 7472 6561 6d62 7566 3a28 302c
2636320 3429 2c31 362c 3136 3b78 5f62 6173 655f 5f39 7374 7265 616d 6275 663a 2830 2c32 3029 2c33 322c 3332 3b78 5f70 6261 7365
```

| | | | | | | | | | | | | | | | | | | | | | | | | |
|---|---|---|---|---|---|---|---|---|---|---|---|---|---|---|---|---|---|---|---|---|---|---|---|---|
| 2636400 | 5f5f | 3973 | 7472 | 6561 | 6d62 | 7566 | 3a28 | 302c | 3230 | 292c | 3634 | 2c33 | 323b | 785f | 7070 | 7472 | 5f5f | 3973 | 7472 | 6561 | 6d62 | 7566 | 3a28 | 302c |
| 2636460 | 3230 | 292c | 3936 | 2c33 | 323b | 785f | 6570 | 7074 | 725f | 5f39 | 7374 | 7265 | 616d | 6275 | 663a | 2830 | 2c32 | 3029 | 2c31 | 3239 | 2c33 | 323b | 785f | 6770 |
| 2636540 | 7472 | 5f5f | 3973 | 7472 | 6561 | 6d62 | 7566 | 3a28 | 302c | 3230 | 292c | 3136 | 302c | 3332 | 3b78 | 5f65 | 6770 | 7472 | 5f5f | 3973 | 7472 | 6561 | 6d62 | 7566 |
| 2636620 | 3a28 | 302c | 3230 | 292c | 3139 | 322c | 3332 | 3b5c | 0078 | 5f65 | 6261 | 636b | 5f5f | 3973 | 7472 | 6561 | 6d62 | 7566 | 3a28 | 302c | 3230 | 292c | 3232 | 342c |
| 2636700 | 3332 | 3b78 | 5f62 | 6c65 | 6e5f | 5f39 | 7374 | 7265 | 616d | 6275 | 663a | 2830 | 2c31 | 292c | 3235 | 362c | 3332 | 3b5f | 5f76 | 7074 | 725f | 5f39 | 7374 | 7265 |
| 2636760 | 616d | 6275 | 663a | 2830 | 2c33 | 3329 | 2c32 | 3838 | 2c33 | 323b | 7866 | 645f | 5f37 | 6669 | 6c65 | 6275 | 663a | 2830 | 2c31 | 292c | 3332 | 302c | 3332 | 3b6d |
| 2637040 | 6f64 | 655f | 5f37 | 6669 | 6c65 | 6275 | 663a | 2830 | 2c31 | 292c | 3335 | 322c | 3332 | 3b6f | 7065 | 6e65 | 645f | 5f37 | 6669 | 6c65 | 6275 | 663a | 2830 | 2c32 |
| 2637120 | 292c | 3338 | 342c | 383b | 6c61 | 7374 | 5f73 | 6565 | 6b5f | 5f37 | 6669 | 6c65 | 6275 | 663a | 2830 | 2c31 | 292c | 3431 | 362c | 3332 | 3b69 | 6e5f | 7374 | 6172 |
| 2637200 | 745f | 5f37 | 6669 | 6c65 | 6275 | 663a | 2830 | 2c32 | 3029 | 2c34 | 3438 | 2c33 | 323b | 6c61 | 6865 | 6164 | 5f5f | 3766 | 696c | 6562 | 7566 | 3a28 | 302c | 3639 |
| 2637260 | 292c | 3438 | 302c | 3136 | 3b3b | 006f | 7065 | 6e70 | 726f | 745f | 5f37 | 6669 | 6c65 | 6275 | 663a | 4728 | 302c | 3129 | 0066 | 696c | 6562 | 7566 | 3a5a | 6366 |
| 2637340 | 696c | 6562 | 7566 | 3b73 | 7472 | 6561 | 6d62 | 7566 | 3b5f | 5f63 | 745f | 5f37 | 6669 | 6c65 | 6275 | 6646 | 7620 | 5f5f | 6374 | 5f5f | 3766 | 696c | 6562 | 7566 |
| 2637420 | 4669 | 205f | 5f63 | 745f | 5f37 | 6669 | 6c65 | 6275 | 6646 | 6950 | 6354 | 3120 | 5f5f | 6374 | 5f5f | 3766 | 696c | 6562 | 7566 | 4652 | 4337 | 6669 | 6c65 | 6275 |
| 2637500 | 6620 | 6973 | 5f6f | 7065 | 6e5f | 5f37 | 6669 | 6c65 | 6275 | 6646 | 7620 | 6664 | 5f5f | 3766 | 696c | 6562 | 7566 | 4676 | 206f | 7065 | 6e5f | 5f37 | 6669 | 6c65 |
| 2637560 | 6275 | 6646 | 5043 | 6369 | 5432 | 2061 | 7474 | 6163 | 505f | 5f37 | 6669 | 6c65 | 6275 | 6646 | 6920 | 636c | 6f73 | 655f | 5f37 | 6669 | 6c65 | 6275 | 6646 | 7620 |
| 2637640 | 5c00 | 5f5f | 6474 | 5f5f | 3766 | 696c | 6562 | 7566 | 4676 | 206f | 7665 | 7266 | 6c6f | 775f | 5f37 | 6669 | 6c65 | 6275 | 6646 | 6920 | 756e | 6465 | 7266 | 6c6f |
| 2637720 | 775f | 5f37 | 6669 | 6c65 | 6275 | 6646 | 7620 | 7379 | 6e63 | 5f5f | 3766 | 696c | 6562 | 7566 | 4676 | 2073 | 6565 | 6b6f | 6666 | 5f5f | 3766 | 696c | 6562 | 7566 |
| 2640000 | 466c | 3873 | 6565 | 6b5f | 6469 | 7269 | 2073 | 6574 | 6275 | 655f | 5f37 | 6669 | 6c65 | 6275 | 6646 | 5063 | 6920 | 6c61 | 7374 | 5f6f | 705f | 5f37 | 6669 | 6c65 |
| 2640060 | 6275 | 6646 | 7620 | 3b6f | 7065 | 6e70 | 726f | 745f | 5f37 | 6669 | 6c65 | 6275 | 6620 | 3b3b | 0066 | 7374 | 7265 | 616d | 6261 | 7365 | 3a54 | 2830 | 2c37 | 3129 |
| 2640140 | 3d73 | 3133 | 3262 | 7566 | 5f5f | 3131 | 6673 | 7472 | 6561 | 6d62 | 6173 | 653a | 2830 | 2c37 | 3029 | 2c30 | 2c35 | 3132 | 3b5f | 5f76 | 7074 | 725f | 5f31 | 3166 |
| 2640220 | 7374 | 7265 | 616d | 6261 | 7365 | 3a28 | 302c | 3333 | 292c | 3531 | 322c | 3332 | 3b50 | 696f | 733a | 2830 | 2c33 | 3529 | 2c35 | 3434 | 2c33 | 323b | 4f69 | 6f73 |
| 2640300 | 3a28 | 302c | 3236 | 292c | 3537 | 362c | 3438 | 303b | 3b00 | 6673 | 7472 | 6561 | 6d62 | 6173 | 653a | 5a63 | 6673 | 7472 | 6561 | 6d62 | 6173 | 653b | 696f | 733b |
| 2640360 | 5f5f | 6374 | 5f5f | 3131 | 6673 | 7472 | 6561 | 6d62 | 6173 | 6546 | 7620 | 5f5f | 6374 | 5f5f | 3131 | 6673 | 7472 | 6561 | 6d62 | 6173 | 6546 | 5043 | 6369 | 5432 |
| 2640440 | 205f | 5f63 | 745f | 5f31 | 3166 | 7374 | 7265 | 616d | 6261 | 7365 | 4669 | 205f | 5f63 | 745f | 5f31 | 3166 | 7374 | 7265 | 616d | 6261 | 7365 | 4669 | 5063 | 5431 |
| 2640520 | 205f | 5f63 | 745f | 5f31 | 3166 | 7374 | 7265 | 616d | 6261 | 7365 | 4652 | 3131 | 6673 | 7472 | 6561 | 6d62 | 6173 | 6520 | 5f5f | 6474 | 5f5f | 3131 | 6673 | 7472 |
| 2640600 | 6561 | 6d62 | 6173 | 6546 | 7620 | 6f70 | 656e | 5f5f | 3131 | 6673 | 7472 | 6561 | 6d62 | 6173 | 6546 | 5043 | 6369 | 5432 | 205c | 0061 | 7474 | 6163 | 685f | 5f31 |
| 2640660 | 3166 | 7374 | 7265 | 616d | 6261 | 7365 | 4669 | 2063 | 6c6f | 7365 | 5f5f | 3131 | 6673 | 7472 | 6561 | 6d62 | 6173 | 6546 | 7620 | 7365 | 7462 | 7566 | 5f5f | 3131 |
| 2640740 | 6673 | 7472 | 6561 | 6462 | 6173 | 6546 | 5063 | 6920 | 7264 | 6275 | 665f | 5f31 | 3166 | 7374 | 7265 | 616d | 6261 | 7365 | 4676 | 2076 | 6572 | 6966 | 795f | 5f31 |
| 2641020 | 3166 | 7374 | 7265 | 616d | 6261 | 7365 | 4669 | 203b | 3b3b | 0073 | 7461 | 7465 | 5f76 | 616c | 7565 | 3a74 | 2830 | 2c32 | 3129 | 004f | 626a | 6563 | 743a | 5428 |
| 2641100 | 302c | 3732 | 293d | 7334 | 5f5f | 7670 | 7472 | 5f5f | 364f | 626a | 6563 | 743a | 2830 | 2c33 | 3329 | 2c30 | 2c33 | 323b | 3b00 | 4f62 | 6a65 | 6374 | 3a5a | 634f |
| 2641160 | 626a | 6563 | 743b | 3b5f | 5f63 | 745f | 5f36 | 4f62 | 6a65 | 6374 | 4676 | 205f | 5f63 | 745f | 5f36 | 4f62 | 6a65 | 6374 | 4652 | 4336 | 4f62 | 6a65 | 6374 | 2065 |
| 2641240 | 7272 | 6f72 | 4d65 | 646f | 7279 | 5f5f | 364f | 626a | 6563 | 7446 | 5063 | 5431 | 2065 | 7870 | 6c61 | 696e | 5f5f | 364f | 626a | 6563 | 7446 | 5063 | 2069 | 6e4f |
| 2641320 | 7264 | 6572 | 5f5f | 364f | 626a | 6563 | 7446 | 5036 | 4f62 | 6a65 | 6374 | 203b | 3b3b | 005f | 5f70 | 7462 | 6c5f | 5f36 | 4f62 | 6a65 | 6374 | 5f5f | 416c | 6c42 |
| 2641400 | 6c6f | 636b | 735f | 6378 | 783a | 4728 | 302c | 3333 | 2900 | 5046 | 3a74 | 2830 | 2c31 | 3529 | 0050 | 4643 | 3a74 | 2830 | 2c31 | 3529 | 0050 | 4649 | 3a74 | 2830 |
| 2641460 | 2c31 | 3529 | 004e | 4f62 | 6a65 | 6374 | 3a54 | 2830 | 2c37 | 3329 | 3d73 | 385f | 5f76 | 7074 | 725f | 5f36 | 4f62 | 6a65 | 6374 | 3a28 | 302c | 3333 | 292c | 302c |
| 2641540 | 3332 | 3b6e | 616d | 655f | 5f37 | 4e4f | 626a | 6563 | 743a | 2830 | 2c32 | 3029 | 2c33 | 322c | 3332 | 3b3b | 004e | 4f62 | 6a65 | 6374 | 3a5a | 634e | 4f62 | 6a65 |
| 2641620 | 6374 | 3b4f | 626a | 6563 | 743b | 5f5f | 6374 | 5f5f | 374e | 4f62 | 6a65 | 6374 | 4650 | 6320 | 5f5f | 6374 | 5f5f | 374e | 4f62 | 6a65 | 6374 | 4652 | 4337 | 4e4f |
| 2641700 | 626a | 6563 | 7420 | 7365 | 744e | 616d | 655f | 5f37 | 4e4f | 626a | 6563 | 7446 | 5063 | 2067 | 6574 | 4e61 | 6d65 | 5f5f | 374e | 4f62 | 6a65 | 6374 | 4676 | 2065 |
| 2641760 | 7870 | 6c61 | 696e | 5f5f | 374e | 4f62 | 6a65 | 6374 | 4650 | 6320 | 6765 | 7441 | 7474 | 725f | 5f37 | 4e4f | 626a | 6563 | 7446 | 6920 | 6765 | 7450 | 726f | 705f |
| 2642040 | 5f37 | 4e4f | 626a | 6563 | 7446 | 5063 | 6920 | 7365 | 7450 | 726f | 705f | 5f31 | 4e4f | 626a | 6563 | 7446 | 5063 | 5431 | 205c | 0073 | 6574 | 5072 | 6f70 | 5f5f |
| 2642120 | 374e | 4f62 | 6a65 | 6374 | 4650 | 6369 | 2073 | 6574 | 5072 | 6f70 | 5f5f | 374e | 4f62 | 6a65 | 6374 | 4650 | 6366 | 2069 | 7347 | 5445 | 5f5f | 374e | 4f62 | 6a65 |
| 2642200 | 6374 | 4650 | 364f | 626a | 6563 | 7420 | 6773 | 4c54 | 455f | 5f37 | 4e4f | 626a | 6563 | 7446 | 5036 | 4f62 | 6a65 | 6374 | 203b | 3b3b | 006f | 7374 | 7265 | 616d |
| 2642260 | 5f77 | 6974 | 6861 | 7373 | 6967 | 6e3a | 5428 | 302c | 3339 | 293d | 7336 | 385f | 5f76 | 7074 | 725f | 5f37 | 6f73 | 7472 | 6561 | 6d3a | 2830 | 2c33 | 3329 | 2c30 |
| 2642340 | 2c33 | 323b | 5069 | 6f73 | 3a28 | 302c | 3335 | 292c | 3332 | 2c33 | 323b | 4f69 | 6f73 | 3a28 | 302c | 3236 | 292c | 3634 | 2c34 | 3830 | 3b3b | 006f | 7374 | 7265 |
| 2642420 | 616d | 5f77 | 6974 | 6861 | 7373 | 6967 | 6e3a | 5a63 | 6f73 | 7472 | 6561 | 6d5f | 7769 | 7468 | 6173 | 7369 | 676e | 3b6f | 7374 | 7265 | 616d | 2069 | 6f73 | 3b5f |
| 2642500 | 5f63 | 745f | 5f31 | 386f | 7374 | 7265 | 616d | 5f77 | 6974 | 6861 | 7373 | 6967 | 6e46 | 7620 | 5f5f | 6374 | 5f5f | 3138 | 6f73 | 7472 | 6561 | 6d5f | 7769 | 7468 |
| 2642560 | 6173 | 7369 | 676e | 4652 | 3138 | 6f73 | 7472 | 6561 | 6d5f | 7769 | 7468 | 6173 | 7369 | 676e | 205f | 5f64 | 745f | 5f31 | 386f | 7374 | 7265 | 616d | 5f77 | 6974 |
| 2642640 | 6861 | 7373 | 6967 | 6e46 | 7620 | 5f5f | 6173 | 5f5f | 3138 | 6f73 | 7472 | 6561 | 6d5f | 7769 | 7468 | 6173 | 7369 | 676e | 4652 | 376f | 7374 | 7265 | 616d | 205c |
| 2642720 | 005f | 5f61 | 735f | 5f31 | 386f | 7374 | 7265 | 616d | 5f77 | 6974 | 6861 | 7373 | 6967 | 6e46 | 5039 | 7374 | 7265 | 616d | 6275 | 6620 | 3b3b | 3b00 | 5046 | 423a |
| 2643000 | 7428 | 302c | 3135 | 2900 | 4c4e | 4f62 | 6a65 | 6374 | 3a54 | 2830 | 2c37 | 3429 | 3d73 | 3132 | 5f5f | 7670 | 7472 | 5f5f | 364f | 626a | 6563 | 743a | 2830 | 2c33 |
| 2643060 | 3329 | 2c30 | 2c33 | 323b | 6e61 | 6d65 | 5f5f | 374e | 4f62 | 6a65 | 6374 | 3a28 | 302c | 3230 | 292c | 3332 | 2c33 | 323b | 6e65 | 7874 | 5f5f | 384c | 4e4f | 626a |
| 2643140 | 6563 | 743a | 2830 | 2c37 | 3529 | 3d2a | 2830 | 2c37 | 3429 | 2c36 | 342c | 3332 | 3b3b | 004c | 4e4f | 626a | 6563 | 743a | 5a63 | 4c4e | 4f62 | 6a65 | 6374 | 3b4e |
| 2643220 | 4f62 | 6a65 | 6374 | 3b5f | 5f63 | 745f | 5f38 | 4c4e | 4f62 | 6a65 | 6374 | 4650 | 6350 | 384c | 4e4f | 626a | 6563 | 7420 | 5f5f | 6374 | 5f5f | 384c | 4e4f | 626a |
| 2643300 | 6563 | 7446 | 5243 | 384c | 4e4f | 626a | 6563 | 7420 | 7365 | 744e | 6578 | 745f | 5f38 | 4c4e | 4f62 | 6a65 | 6374 | 4650 | 384c | 4e4f | 626a | 6563 | 7420 | 6765 |
| 2643360 | 744e | 6578 | 745f | 5f38 | 4c4e | 4f62 | 6a65 | 6374 | 4676 | 203b | 3b3b | 004c | 4f62 | 6a65 | 6374 | 3a54 | 2830 | 2c37 | 3629 | 3d73 | 385f | 5f76 | 7074 | 725f |
| 2643440 | 5f36 | 4f62 | 6a65 | 6374 | 3a28 | 302c | 3333 | 292c | 302c | 3332 | 3b6e | 6578 | 745f | 5f37 | 4c4f | 626a | 6563 | 743a | 2830 | 2c37 | 3729 | 3d2a | 2830 | 2c37 |

| | | | | | | | | | | | | | | | | | | | | | | | | |
|---|---|---|---|---|---|---|---|---|---|---|---|---|---|---|---|---|---|---|---|---|---|---|---|---|
| 2643520 | 3629 | 2c33 | 322c | 3332 | 3b3b | 004c | 4f62 | 6a65 | 6374 | 3a5a | 634c | 4f62 | 6a65 | 6374 | 3b4f | 626a | 6563 | 743b | 5f5f | 6374 | 5f5f | 374c | 4f62 | 6a65 |
| 2643600 | 6374 | 4650 | 374c | 4f62 | 6a65 | 6374 | 205f | 5f63 | 745f | 5f37 | 4c4f | 626a | 6563 | 7446 | 5243 | 374c | 4f62 | 6a65 | 6374 | 2073 | 6574 | 4e65 | 7874 | 5f5f |
| 2643660 | 374c | 4f62 | 6a65 | 6374 | 4650 | 374c | 4f62 | 6a65 | 6374 | 2067 | 6574 | 4e65 | 7874 | 5f5f | 374c | 4f62 | 6a65 | 6374 | 4676 | 203b | 3b3b | 004c | 504f | 626a |
| 2643740 | 6563 | 743a | 5428 | 302c | 3738 | 293d | 7331 | 325f | 5f76 | 7074 | 725f | 5f36 | 4f62 | 6a65 | 6374 | 3a28 | 302c | 3333 | 292c | 302c | 3332 | 3b6e | 6578 | 745f |
| 2644020 | 5f37 | 4c4f | 626a | 6563 | 743a | 2830 | 2c37 | 3729 | 2c33 | 322c | 3332 | 3b6e | 6f62 | 6a70 | 7472 | 5f5f | 384c | 504f | 626a | 6563 | 743a | 2830 | 2c37 | 3929 |
| 2644100 | 3d2a | 2830 | 2c37 | 3329 | 2c36 | 342c | 3332 | 3b3b | 004c | 504f | 626a | 6563 | 743a | 5a63 | 4c50 | 4f62 | 6a65 | 6374 | 3b4c | 4f62 | 6a65 | 6374 | 3b5f | 5f63 |
| 2644160 | 745f | 5f38 | 4c50 | 4f62 | 6a65 | 6374 | 4650 | 374e | 4f62 | 6a65 | 6374 | 5037 | 4c4f | 626a | 6563 | 7420 | 5f5f | 6374 | 5f5f | 384c | 504f | 626a | 6563 | 7446 |
| 2644240 | 5243 | 384c | 504f | 626a | 6563 | 7420 | 7365 | 744f | 626a | 6563 | 745f | 5f38 | 4c50 | 4f62 | 6a65 | 6374 | 4650 | 374e | 4f62 | 6a65 | 6374 | 2067 | 6574 | 4f62 |
| 2644320 | 6a65 | 6374 | 5f5f | 384c | 504f | 626a | 6563 | 7446 | 7620 | 6578 | 706c | 6169 | 6e5f | 5f38 | 4c50 | 4f62 | 6a65 | 6374 | 4650 | 6320 | 3b3b | 3b00 | 5f5f | 7074 |
| 2644400 | 626c | 5f5f | 384c | 504f | 626a | 6563 | 745f | 5f41 | 6c6c | 426c | 6f63 | 6b73 | 5f63 | 7878 | 3a47 | 2830 | 2c33 | 3329 | 004c | 6973 | 743a | 5428 | 302c | 3830 |
| 2644460 | 293d | 7331 | 3263 | 6f75 | 6e74 | 5f5f | 344c | 6973 | 743a | 2830 | 2c31 | 292c | 302c | 3332 | 3b70 | 7472 | 4c4f | 626a | 6563 | 745f | 5f34 | 4c69 | 7374 | 3a28 |
| 2644540 | 302c | 3737 | 292c | 3332 | 2c33 | 323b | 5f5f | 7670 | 7472 | 5f5f | 344c | 6973 | 743a | 2830 | 2c33 | 3329 | 2c36 | 342c | 3332 | 3b3b | 004c | 6973 | 743a | 5a63 |
| 2644620 | 4c69 | 7374 | 3b3b | 5f5f | 6374 | 5f5f | 344c | 6973 | 7446 | 7620 | 5f5f | 6374 | 5f5f | 344c | 6973 | 7446 | 5243 | 344c | 6973 | 7420 | 5f5f | 6474 | 5f5f | 344c |
| 2644700 | 6973 | 7446 | 7620 | 6765 | 7443 | 6f75 | 6e74 | 5f5f | 344c | 6973 | 7446 | 7620 | 6765 | 7454 | 6f70 | 5f5f | 344c | 6973 | 7446 | 7620 | 7365 | 7454 | 6f70 | 5f5f |
| 2644760 | 344c | 6973 | 7446 | 5037 | 4c4f | 626a | 6563 | 7420 | 6572 | 726f | 724d | 656d | 6f72 | 795f | 5f34 | 4c69 | 7374 | 4650 | 6354 | 3120 | 6272 | 6f61 | 6463 | 6173 |
| 2645040 | 745f | 5f34 | 4c69 | 7374 | 464d | 364f | 626a | 6563 | 7446 | 765f | 7620 | 6578 | 706c | 6169 | 6e5f | 5f34 | 4c69 | 7374 | 4650 | 6320 | 5c00 | 696e | 7365 | 7274 |
| 2645120 | 5f5f | 344c | 6973 | 7446 | 5037 | 4c4f | 626a | 6563 | 7420 | 6973 | 4d65 | 6d62 | 6572 | 5f5f | 344c | 6973 | 7446 | 5037 | 4c4f | 626a | 6563 | 7420 | 6973 | 4d65 |
| 2645200 | 6d62 | 6572 | 5f5f | 344c | 6973 | 7446 | 5063 | 2069 | 7345 | 7175 | 616c | 5f5f | 344c | 6973 | 7446 | 5234 | 4c69 | 7374 | 2072 | 656d | 6f76 | 655f | 5f34 | 4c69 |
| 2645260 | 7374 | 4650 | 6320 | 3b3b | 3b00 | 5f5f | 7074 | 626c | 5f5f | 344c | 6973 | 745f | 5f41 | 6c6c | 426c | 6f63 | 6b73 | 5f63 | 7878 | 3a47 | 2830 | 2c33 | 3329 | 0050 |
| 2645340 | 4c69 | 7374 | 3a54 | 2830 | 2c38 | 3129 | 3173 | 3132 | 636f | 756e | 745f | 5f34 | 4c69 | 7374 | 3a28 | 302c | 3129 | 2c30 | 2c33 | 323b | 7074 | 724c | 4f62 | 6a65 |
| 2645420 | 6374 | 5f5f | 344c | 6973 | 743a | 2830 | 2c37 | 3729 | 2c33 | 322c | 3332 | 3b5f | 5f76 | 7074 | 725f | 5f34 | 4c69 | 7374 | 3a28 | 302c | 3333 | 292c | 3634 | 2c33 |
| 2645500 | 323b | 3b00 | 504c | 6973 | 743a | 5a63 | 504c | 6973 | 743b | 4c69 | 7374 | 3b69 | 6e73 | 6572 | 745f | 5f35 | 504c | 6973 | 7446 | 5038 | 4c50 | 4f62 | 6a65 | 6374 |
| 2645560 | 2069 | 6e73 | 6572 | 745f | 5f35 | 504c | 6973 | 7446 | 5235 | 504c | 6973 | 7420 | 536f | 7274 | 5f50 | 4c69 | 7374 | 5f5f | 3550 | 4c69 | 7374 | 4669 | 2072 | 6576 |
| 2645640 | 6572 | 7365 | 5f5f | 3550 | 4c69 | 7374 | 4676 | 2069 | 6e73 | 6572 | 7441 | 6674 | 6572 | 5f5f | 3550 | 4c69 | 7374 | 4650 | 384c | 504f | 626a | 6563 | 7454 | 3120 |
| 2645720 | 7265 | 6d6f | 7665 | 5f5f | 3550 | 4c69 | 7374 | 4650 | 384c | 504f | 626a | 6563 | 7420 | 7265 | 6d6f | 7665 | 5f5f | 3550 | 4c69 | 7374 | 4650 | 6320 | 6973 | 4d65 |
| 2646000 | 6d62 | 6572 | 5f5f | 3550 | 4c69 | 7374 | 4650 | 6320 | 5c00 | 6973 | 4d65 | 6d62 | 6572 | 5f5f | 3550 | 4c69 | 7374 | 4650 | 374c | 4f62 | 6a65 | 6374 | 2069 | 7345 |
| 2646060 | 7175 | 616c | 5f5f | 3550 | 4c69 | 7374 | 4652 | 344c | 6973 | 7420 | 6578 | 706c | 6169 | 6e5f | 5f35 | 504c | 6973 | 7446 | 5063 | 205f | 5f63 | 745f | 5f35 | 504c |
| 2646140 | 6973 | 7446 | 5243 | 3550 | 4c69 | 7374 | 205f | 5f63 | 745f | 5f35 | 504c | 6973 | 7446 | 7620 | 3b3b | 3b00 | 5f5f | 7074 | 626c | 5f5f | 3550 | 4c69 | 7374 | 5f5f |
| 2646220 | 416c | 6c42 | 6c6f | 636b | 735f | 6378 | 783a | 4728 | 302c | 3333 | 2900 | 4c69 | 7374 | 4974 | 6572 | 6174 | 6f72 | 3a54 | 2830 | 2c38 | 3229 | 3d73 | 386c | 6973 |
| 2646300 | 745f | 5f31 | 324c | 6973 | 7449 | 7465 | 7261 | 746f | 723a | 2830 | 2c38 | 3329 | 3d2a | 2830 | 2c38 | 3029 | 2c30 | 2c33 | 323b | 705f | 5f31 | 324c | 6973 | 7449 |
| 2646360 | 7465 | 7261 | 746f | 723a | 2830 | 2c37 | 3729 | 2c33 | 322c | 3332 | 3b3b | 004c | 6973 | 7449 | 7465 | 7261 | 746f | 723a | 5a63 | 4c69 | 7374 | 4974 | 6572 | 6174 |
| 2646440 | 6f72 | 3b3b | 5f5f | 6374 | 5f5f | 3132 | 4c69 | 7374 | 4974 | 6572 | 6174 | 6f72 | 4652 | 344c | 6973 | 7420 | 7265 | 7365 | 745f | 5f31 | 324c | 6973 | 7449 | 7465 |
| 2646520 | 7261 | 746f | 7246 | 7620 | 6174 | 7461 | 6368 | 5f5f | 3132 | 4c69 | 7374 | 4974 | 6572 | 6174 | 6f72 | 4652 | 344c | 6973 | 7420 | 6765 | 7443 | 7572 | 7265 | 6e74 |
| 2646600 | 5f5f | 3132 | 4c69 | 7374 | 4974 | 6572 | 6174 | 6f72 | 4676 | 205f | 5f70 | 705f | 5f31 | 324c | 6973 | 7449 | 7465 | 7261 | 746f | 7246 | 7620 | 3b3b | 3b00 | 5661 |
| 2646660 | 6c75 | 655f | 5479 | 7065 | 3a54 | 2830 | 2c38 | 3429 | 3d65 | 554e | 4b4e | 4f57 | 4e56 | 3a30 | 2c53 | 5452 | 494e | 473a | 312c | 494e | 5445 | 4745 | 523a | 322c |
| 2646740 | 464c | 4f41 | 543a | 332c | 3b00 | 426c | 6f63 | 6b5f | 5479 | 7065 | 3a54 | 2830 | 2c38 | 3529 | 3d65 | 554e | 4b4e | 4f57 | 4e42 | 3a30 | 2c45 | 4e54 | 4954 | 593a |
| 2647020 | 312c | 4655 | 4e43 | 5449 | 4f4e | 3a32 | 2c50 | 524f | 4345 | 4455 | 5245 | 3a33 | 2c3b | 0045 | 6e74 | 6974 | 795f | 5479 | 7065 | 3a54 | 2830 | 2c38 | 3629 | 3d65 |
| 2647100 | 554e | 4b4e | 4f57 | 4e45 | 3a30 | 2c41 | 5243 | 4849 | 5445 | 4354 | 5552 | 453a | 312c | 5355 | 4250 | 524f | 4752 | 414d | 3a32 | 2c3b | 0050 | 696e | 5f54 | 7970 |
| 2647160 | 653a | 5428 | 302c | 3837 | 293d | 6555 | 4e4b | 4e4f | 574e | 503a | 302c | 494e | 5049 | 4e3a | 312c | 4f55 | 5450 | 494e | 3a32 | 2c49 | 4e4f | 5554 | 5049 | 4e3a |
| 2647240 | 332c | 3b00 | 5061 | 7261 | 5f43 | 6c61 | 7373 | 3a54 | 2830 | 2c38 | 3829 | 3d65 | 554e | 4b4e | 4f57 | 4e43 | 3a30 | 2c46 | 4f52 | 4d41 | 4c3a | 312c | 4143 | 5455 |
| 2647320 | 414c | 3a32 | 2c52 | 4553 | 4f4c | 5645 | 443a | 332c | 3b00 | 424f | 4f4c | 4541 | 4e3a | 5428 | 302c | 3839 | 293d | 6546 | 616c | 7365 | 3a30 | 2c54 | 7275 | 653a |
| 2647400 | 312c | 3b00 | 426f | 6f6c | 6561 | 6e3a | 5428 | 302c | 3930 | 293d | 6566 | 616c | 7365 | 3a30 | 2c74 | 7275 | 653a | 312c | 3b00 | 4275 | 6666 | 6572 | 3a47 | 2830 |
| 2647460 | 2c32 | 3029 | 004d | 6f64 | 4765 | 6e3a | 5428 | 302c | 3931 | 293d | 7338 | 4553 | 7461 | 7465 | 5f5f | 364d | 6f64 | 4765 | 6e3a | 2830 | 2c39 | 3029 | 2c30 | 2c33 |
| 2647540 | 323b | 5f5f | 7670 | 7472 | 5f5f | 364d | 6f64 | 4765 | 6e3a | 2830 | 2c33 | 3329 | 2c33 | 322c | 3332 | 3b3b | 004d | 6f64 | 4765 | 6e3a | 5a63 | 4d6f | 6447 | 656e |
| 2647620 | 3b3b | 5f5f | 6374 | 5f5f | 364d | 6f64 | 4765 | 6e46 | 7620 | 5f5f | 6374 | 5f5f | 364d | 6f64 | 4765 | 6e46 | 5243 | 364d | 6f64 | 4765 | 6e20 | 7365 | 745f | 4553 |
| 2647700 | 7461 | 7465 | 5f5f | 364d | 6f64 | 4765 | 6e46 | 3742 | 6f6f | 6c65 | 616e | 2067 | 6574 | 5f45 | 5374 | 6174 | 655f | 5f36 | 4d6f | 6447 | 656e | 4676 | 2073 | 6574 |
| 2647760 | 496e | 6465 | 785f | 5f36 | 4d6f | 6447 | 656e | 4676 | 2073 | 6574 | 4e61 | 6d65 | 496e | 6465 | 785f | 5f36 | 4d6f | 6447 | 656e | 4650 | 6320 | 4c6f | 6164 | 5f56 |
| 2650040 | 4844 | 4c5f | 4461 | 7461 | 5f5f | 364d | 6f64 | 4765 | 6e46 | 5037 | 4e4f | 626a | 6563 | 7420 | 5c00 | 436f | 6d70 | 6f73 | 655f | 4d6f | 6447 | 656e | 5f44 | 6573 |
| 2650120 | 6372 | 6970 | 746f | 725f | 5f36 | 4d6f | 6447 | 656e | 4650 | 6320 | 6578 | 706c | 6169 | 6e5f | 5f36 | 4d6f | 6447 | 656e | 4676 | 203b | 3b3b | 005f | 5f70 | 7462 |
| 2650200 | 6c5f | 5f36 | 4d6f | 6447 | 656e | 5f5f | 416c | 6c42 | 6c6f | 636b | 735f | 6378 | 783a | 4728 | 302c | 3333 | 2900 | 656e | 7469 | 7479 | 3a54 | 2830 | 2c39 | 3229 |
| 2650260 | 3d73 | 3630 | 5f5f | 7670 | 7472 | 5f5f | 364f | 626a | 6563 | 743a | 2830 | 2c33 | 3329 | 2c30 | 2c33 | 323b | 6e61 | 6d65 | 5f5f | 374e | 4f62 | 6a65 | 6374 | 3a28 |
| 2650340 | 302c | 3230 | 292c | 3332 | 2c33 | 323b | 6e61 | 6d65 | 5f5f | 3665 | 6e74 | 6974 | 793a | 2830 | 2c32 | 3029 | 2c36 | 342c | 3332 | 3b46 | 696c | 654e | 616d | 655f |
| 2650420 | 5f36 | 656e | 7469 | 7479 | 3a28 | 302c | 3230 | 292c | 3936 | 2c33 | 323b | 6172 | 6368 | 6e61 | 6d65 | 5f5f | 3665 | 6e74 | 6974 | 793a | 2830 | 2c32 | 3029 | 2c31 |
| 2650500 | 3238 | 2c33 | 323b | 7479 | 7065 | 5f5f | 3665 | 6e74 | 6974 | 793a | 2830 | 2c31 | 292c | 3136 | 302c | 3332 | 3b61 | 7263 | 685f | 6c69 | 6e65 | 5f5f | 3665 | 6e74 |
| 2650560 | 6974 | 793a | 2830 | 2c31 | 292c | 3139 | 322c | 3332 | 3b63 | 616c | 6c5f | 6c69 | 6e65 | 5f5f | 3665 | 6e74 | 6974 | 793a | 2830 | 2c31 | 292c | 3232 | 342c | 3332 |

```
2650640  3b5c 0070 7263 735f 6c69 6e65 5f5f 3665 6e74 6974 793a 2830 2c31 292c 3235 362c 3332 3b71 7561 6c69 6669 6564 5f5f 3665
2650720  6e74 6974 793a 2830 2c38 3129 2c32 3838 2c39 363b 7375 625f 626c 6f63 6b73 5f5f 3665 6e74 6974 793a 2830 2c38 3129 2c33
2651000  3834 2c39 363b 3b00 656e 7469 7479 3a5a 6365 6e74 6974 793b 4e4f 626a 6563 743b 5f5f 6374 5f5f 3665 6e74 6974 7946 7620
2651060  5f5f 6374 5f5f 3665 6e74 6974 7946 5243 3665 6e74 6974 7920 5f5f 6474 5f5f 3665 6e74 6974 7946 7620 7365 745f 656e 7469
2651140  7479 5f6e 616d 655f 5f36 656e 7469 7479 4650 6320 7365 745f 656e 7469 7479 5f66 696c 655f 5f36 656e 7469 7479 4650 6320
2651220  7365 745f 656e 7469 7479 5f61 7263 686e 616d 655f 5f36 656e 7469 7479 4650 6320 7365 745f 656e 7469 7479 5f74 7970 655f
2651300  5f36 656e 7469 7479 4650 6320 5c00 7365 745f 6172 6368 5f6c 696e 655f 5f36 656e 7469 7479 4669 2073 6574 5f63 616c 6c5f
2651360  6c69 6e65 5f5f 3665 6e74 6974 7946 6920 7365 745f 7072 6373 5f6c 696e 655f 5f36 656e 7469 7479 4669 2067 6574 5f65 6e74
2651440  6974 795f 6e61 6465 5f5f 3665 6e74 6974 7946 7620 6765 745f 656e 7469 7479 5f61 7263 686e 616d 655f 5f36 656e 7469 7479
2651520  4676 2067 6574 5f65 6e74 6974 795f 6669 6c65 5f5f 3665 6e74 6974 7946 7620 6765 745f 656e 7469 7479 5f74 7970 655f 5f36
2651600  656e 7469 7479 4676 205c 0067 6574 5f61 7263 685f 6c69 6e65 5f5f 3665 6e74 6974 7946 7620 6765 745f 6361 6c6c 5f6c 696e
2651660  655f 5f36 656e 7469 7479 4676 2067 6574 5f70 7263 735f 6c69 6e65 5f5f 3665 6e74 6974 7946 7620 6973 4754 455f 5f36 656e
2651740  7469 7479 4650 364f 626a 6563 7420 6973 4c54 455f 5f36 656e 7469 7479 4650 364f 626a 6563 7420 6578 706c 6169 6e5f 5f36
2652020  656e 7469 7479 4650 6320 3b3b 3b00 5f5f 7074 626c 5f5f 3665 6e74 6974 795f 5f41 6c6c 426c 6f63 6b73 5f63 7878 3a47 2830
2652100  2c33 3329 0062 6c6f 636b 3a54 2830 2c39 3329 3d73 3134 305f 5f76 7074 725f 5f36 4f62 6a65 6374 3a28 302c 3333 292c 302c
2652160  3332 3b6e 616d 655f 5f37 4e4f 626a 6563 743a 2830 2c32 3029 2c33 322c 3332 3b6e 616d 655f 5f35 626c 6f63 6b3a 2830 2c32
2652240  3029 2c36 342c 3332 3b74 7970 655f 5f35 626c 6f63 6b3a 2830 2c31 292c 3936 2c33 323b 4d47 5f4e 616d 655f 5f35 626c 6f63
2652320  6b3a 2830 2c32 3029 2c31 3238 2c33 323b 4d47 5f54 7970 655f 5f35 626c 6f63 6b3a 2830 2c32 3029 2c31 3630 2c33 323b 4d47
2652400  5f53 7562 5479 7065 5f5f 3562 6c6f 636b 3a28 302c 3230 292c 3139 322c 3332 3b50 6172 656e 745f 5f35 626c 6f63 6b3a 2830
2652460  2c39 3229 2c32 3234 2c34 3830 3b5c 004d 4744 7363 7270 746e 5f5f 3562 6c6f 636b 3a28 302c 3934 293d 2a28 302c 3931 292c
2652540  3730 342c 3332 3b41 6374 7561 6c5f 5f35 626c 6f63 6b3a 2830 2c38 3129 2c37 3336 2c39 363b 466f 726d 616c 5f5f 3562 6c6f
2652620  636b 3a28 302c 3831 292c 3833 322c 3936 3b52 6573 6f6c 7665 645f 5f35 626c 6f63 6b3a 2830 2c38 3129 2c39 3238 2c39 363b
2652700  4174 7472 6962 7574 6573 5f5f 3562 6c6f 636b 3a28 302c 3831 292c 3130 3234 2c39 363b 3b00 626c 6f63 6b3a 5a63 626c 6f63
2652760  6b3b 4e4f 626a 6563 743b 5f5f 6374 5f5f 3562 6c6f 636b 4676 205f 5f63 745f 5f35 626c 6f63 6b46 5243 3562 6c6f 636b 205f
2653040  5f64 745f 5f35 626c 6f63 6b46 7620 7365 745f 626c 6f63 6b5f 6e61 6d65 5f5f 3562 6c6f 636b 4650 6320 7365 745f 626c 6f63
2653120  6b5f 7479 7065 5f5f 3562 6c6f 636b 4650 6320 6765 745f 626c 6f63 6b5f 6e61 6d65 5f5f 3562 6c6f 636b 4676 2067 6574 5f62
2653200  6c6f 636b 5f74 7970 655f 5f35 626c 6f63 6b46 7620 6765 745f 626c 6f63 6b5f 7061 7265 6e74 5f5f 3562 6c6f 636b 4676 205c
2653260  0067 6574 5f46 6f72 6d61 6c5f 5f35 626c 6f63 6b46 7620 6765 745f 4163 7475 616c 5f5f 3562 6c6f 636b 4676 2067 6574 5f52
2653340  6573 6f6c 7665 645f 5f35 626c 6f63 6b46 7620 6765 745f 4174 7472 6962 7574 655f 5f35 626c 6f63 6b46 7620 6765 745f 636f
2653420  6d70 5f6c 656e 6774 685f 5f35 626c 6f63 6b46 7620 6973 5175 616c 6966 6965 645f 5f35 626c 6f63 6b46 7620 6973 4c54 455f
2653500  5f35 626c 6f63 6b46 5036 4f62 6a65 6374 2069 7347 5445 5f5f 3562 6c6f 636b 4650 364f 626a 6563 7420 6578 706c 6169 6e5f
2653560  5f35 626c 6f63 6b46 5063 205c 0052 6576 6572 7365 416c 6c4c 6973 7473 5f5f 3562 6c6f 636b 4676 2043 6865 636b 5061 7261
2653640  4c69 7374 735f 5f35 626c 6f63 6b46 7620 4360 6563 6b50 6172 616d 4c69 7374 5f5f 3562 6c6f 636b 4650 3550 4c69 7374 2057
2653720  5f56 4844 4c5f 436f 6d70 496e 7374 5f5f 3562 6c6f 636b 4676 2057 5f56 4844 4c5f 436f 6d70 4465 635f 5f35 626c 6f63 6b46
2654000  7620 6765 745f 5648 444c 5f43 6f6d 704c 6162 6c65 5f5f 3562 6c6f 636b 4650 6320 6765 745f 5648 444c 5f43 6f6d 704e 616d
2654060  655f 5f35 626c 6f63 6b46 5063 205c 0057 5f4d 475f 436f 6d70 4473 6372 7074 6e5f 5f35 626c 6f63 6b46 7620 575f 4d47 5f43
2654140  6865 636b 436f 6d70 5f5f 3562 6c6f 636b 4676 2057 5f43 4c5f 4172 6368 426f 6479 5f5f 3562 6c6f 636b 4676 2057 5f43 4c5f
2654220  456e 7469 7479 4465 635f 5f35 626c 6f63 6b46 7620 3b3b 3b00 5f5f 7074 626c 5f5f 3562 6c6f 636b 5f5f 416c 6c42 6c6f 636b
2654300  735f 6378 783a 4728 302c 3333 2900 5f5f 6374 5f5f 3665 6e74 6974 7946 763a 6628 302c 3935 2a28 302c 3932 2900 5f5f
2654360  3074 6869 733a 7028 302c 3935 2900 2e2f 6878 782f 656e 7469 7479 2e68 7878 005f 5f30 7468 6973 3a72 2830 2c39 3529 005f
2654440  5f30 7468 6973 203a 5a74 6c00 5f5f 6374 5f5f 3665 6e74 6974 7946 7620 3a5a 7446 0044 6573 6967 6e55 6e69 743a 5428 302c
2654520  3936 293d 7335 325f 5f76 7074 725f 5f36 4f62 6a65 6374 3a28 302c 3333 292c 302c 3332 3b6e 616d 655f 5f37 4e4f 626a 6563
2654600  743a 2830 2c32 3029 2c33 322c 3332 3b44 6555 6e4e 616d 655f 5f31 3044 6573 6967 6e55 6e69 743a 2830 2c32 3029 2c36 342c
2654660  3332 3b46 696c 654e 616d 655f 5f31 3044 6573 6967 6e55 6e69 743a 2830 2c32 3029 2c39 362c 3332 3b41 7263 684e 616d 655f
2654740  5f31 3044 6573 6967 6e55 6e69 743a 2830 2c32 3029 2c31 3238 2c33 323b 4465 556e 5479 7065 5f5f 3130 4465 7369 676e 556e
2655020  6974 3a28 302c 3129 2c31 3630 2c33 323b 4172 6368 4c69 6e65 5f5f 3130 4465 7369 676e 556e 6974 3a28 302c 3129 2c31 3932
2655100  2c33 323b 5175 616c 6966 6965 645f 5f31 3044 6573 6967 6e55 6e69 743a 2830 2c38 3129 2c32 3234 2c39 363b 5375 6242 6c6f
2655160  636b 735f 5f31 3044 6573 6967 6e55 6e69 743a 2830 2c38 3129 2c33 3230 2c39 363b 3b00 4465 7369 676e 556e 6974 3a5a 6344
2655240  6573 6967 6e55 6e69 743b 4e4f 626a 6563 743b 5f5f 6374 5f5f 3130 4465 7369 676e 556e 6974 4676 205f 5f63 745f 5f31 3044
2655320  6573 6967 6e55 6e69 7446 5063 205f 5f63 745f 5f31 3044 6573 6967 6e55 6e69 7446 5036 656e 7469 7479 205f 5f63 745f 5f31
2655400  3044 6573 6967 6e55 6e69 7446 5243 3130 4465 7369 676e 556e 6974 205f 5f64 745f 5f31 3044 6573 6967 6e55 6e69 7446 7620
2655460  7365 745f 4455 5f44 6555 6e4e 616d 655f 5f31 3044 6573 6967 6e55 6e69 7446 5063 205c 0073 6574 5f44 555f 4669 6c65 4e61
2655540  6d65 5f5f 3130 4465 7369 676e 556e 6974 4650 6320 7365 745f 4455 5f41 7263 684e 616d 655f 5f31 3044 6573 6967 6e55 6e69
2655620  7446 5063 2073 6574 5f44 555f 4465 556e 5479 7065 5f5f 3130 4465 7369 676e 556e 6974 4669 2073 6574 5f44 555f 4172 6368
2655700  4c69 6e65 5f5f 3130 4465 7369 676e 556e 6974 4669 2067 6574 5f44 555f 4669 6c65 4e61 6d65 5f5f 3130 4465 7369 676e 556e
```

| | | | | | | | | | | | | | | | | | | | | | | | | |
|---|---|---|---|---|---|---|---|---|---|---|---|---|---|---|---|---|---|---|---|---|---|---|---|---|
| 2655760 | 6974 | 4676 | 2045 | 7175 | 616c | 5f5f | 3130 | 4465 | 7369 | 676e | 556e | 6974 | 4650 | 3665 | 6e74 | 6974 | 7920 | 5c00 | 6973 | 4754 | 455f | 5f31 | 3044 | 6573 |
| 2656040 | 6967 | 6e55 | 6e69 | 7446 | 5036 | 4f62 | 6a65 | 6374 | 2069 | 734c | 5445 | 5f5f | 3130 | 4465 | 7369 | 676e | 556e | 6974 | 4650 | 364f | 626a | 6563 | 7420 | 6765 |
| 2656120 | 745f | 4455 | 5f51 | 7561 | 6c69 | 6669 | 6564 | 5f5f | 3130 | 4465 | 7369 | 676e | 556e | 6974 | 4676 | 2067 | 6574 | 5f44 | 555f | 5375 | 6242 | 6c6f | 636b | 735f |
| 2656200 | 5f31 | 3044 | 6573 | 6967 | 6e55 | 6e69 | 7446 | 7620 | 4578 | 7061 | 6e64 | 5f56 | 4844 | 4c5f | 4455 | 5f5f | 3130 | 4465 | 7369 | 676e | 556e | 6974 | 4676 | 2065 |
| 2656260 | 7870 | 6c61 | 696e | 5f5f | 3130 | 4465 | 7369 | 676e | 556e | 6974 | 4650 | 6320 | 3b3b | 3b00 | 5f5f | 7074 | 626c | 5f5f | 3130 | 4465 | 7369 | 676e | 556e | 6974 |
| 2656340 | 5f5f | 416c | 6c42 | 6c6f | 636b | 735f | 6378 | 783a | 4728 | 302c | 3333 | 2900 | 4669 | 6c65 | 556e | 6974 | 3a54 | 2830 | 2c39 | 3729 | 3d73 | 3234 | 5f5f | 7670 |
| 2656420 | 7472 | 5f5f | 364f | 626a | 6563 | 743a | 2830 | 2c33 | 3329 | 2c30 | 2c33 | 323b | 6e61 | 6d65 | 5f5f | 374e | 4f62 | 6a65 | 6374 | 3a29 | 302c | 3230 | 292c | 3332 |
| 2656500 | 2c33 | 323b | 4669 | 6c65 | 4e61 | 6d65 | 5f5f | 3846 | 696c | 6555 | 6e69 | 743a | 2830 | 2c32 | 3029 | 2c36 | 342c | 3332 | 3b45 | 6e74 | 6974 | 794c | 6973 | 745f |
| 2656560 | 5f38 | 4669 | 6c65 | 556e | 6974 | 3a28 | 302c | 3831 | 292c | 3936 | 2c39 | 363b | 3b00 | 4669 | 6c65 | 556e | 6974 | 3a5a | 6346 | 696c | 6555 | 6e69 | 743b | 4e4f |
| 2656640 | 626a | 6563 | 743b | 5f5f | 6374 | 5f5f | 3846 | 696c | 6555 | 6e69 | 7446 | 7620 | 5f5f | 6374 | 5f5f | 3846 | 696c | 6555 | 6e69 | 7446 | 5063 | 205f | 5f63 | 745f |
| 2656720 | 5f38 | 4669 | 6c65 | 556e | 6974 | 4652 | 4338 | 4669 | 6c65 | 556e | 6974 | 205f | 5f64 | 745f | 5f38 | 4669 | 6c65 | 556e | 6974 | 4676 | 2073 | 6574 | 5f46 | 555f |
| 2657000 | 4669 | 6c65 | 4e61 | 6d65 | 5f5f | 3846 | 696c | 6555 | 6e69 | 7446 | 5063 | 2067 | 6574 | 5f46 | 555f | 4669 | 6c65 | 4e61 | 6d65 | 5f5f | 3846 | 696c | 6555 | 6e69 |
| 2657060 | 7446 | 7620 | 6765 | 745f | 456e | 7469 | 7479 | 4c69 | 7374 | 5f5f | 3846 | 696c | 6555 | 6e69 | 7446 | 7620 | 5c00 | 4578 | 7061 | 6e64 | 5f56 | 4844 | 4c5f | 4455 |
| 2657140 | 5f5f | 3846 | 696c | 6555 | 6e69 | 7446 | 7620 | 6578 | 736c | 6169 | 6e5f | 5f38 | 4669 | 6c65 | 556e | 6974 | 4650 | 6320 | 3b3b | 3b00 | 5f5f | 7074 | 626c | 5f5f |
| 2657220 | 3846 | 696c | 6555 | 6e69 | 745f | 5f41 | 6c6c | 426c | 6f63 | 6b73 | 5f63 | 7878 | 3a47 | 2830 | 2c33 | 3329 | 0041 | 6c6c | 426c | 6f63 | 6b73 | 3a54 | 2830 | 2c39 |
| 2657300 | 3829 | 3d73 | 3434 | 5f5f | 7670 | 7472 | 5f5f | 364f | 626a | 6563 | 743a | 2830 | 2c33 | 3329 | 2c30 | 2c33 | 323b | 6e61 | 6d65 | 5f5f | 374e | 4f62 | 6a65 | 6374 |
| 2657360 | 3a28 | 302c | 3230 | 292c | 3332 | 2c33 | 323b | 426c | 6f63 | 6b4c | 6973 | 745f | 5f39 | 416c | 6c42 | 6c6f | 636b | 733a | 2830 | 2c38 | 3129 | 2c36 | 342c | 3936 |
| 2657440 | 3b44 | 554c | 6973 | 745f | 5f39 | 416c | 6c42 | 6c6f | 636b | 733a | 2830 | 2c38 | 3129 | 2c31 | 3630 | 2c39 | 363b | 4655 | 4c69 | 7374 | 5f5f | 3941 | 6c6c | 426c |
| 2657520 | 6f63 | 6b73 | 3a28 | 302c | 3831 | 292c | 3235 | 362c | 3936 | 3b3b | 0041 | 6c6c | 426c | 6f63 | 6b73 | 3a5a | 6341 | 6c6c | 426c | 6f63 | 6b73 | 3b4e | 4f62 | 6a65 |
| 2657600 | 6374 | 3b5f | 5f63 | 745f | 5f39 | 416c | 6c42 | 6c6f | 636b | 7346 | 7620 | 5f5f | 6374 | 5f5f | 3941 | 6c6c | 426c | 6f63 | 6b73 | 4652 | 4339 | 416c | 6c42 | 6c6f |
| 2657660 | 636b | 7320 | 5f5f | 6474 | 5f5f | 3941 | 6c6c | 426c | 6f63 | 6b73 | 4676 | 2067 | 6574 | 5f42 | 6c6f | 636b | 4c69 | 7374 | 5f5f | 3941 | 6c6c | 426c | 6f63 | 6b73 |
| 2657740 | 4676 | 2067 | 6574 | 5f44 | 554c | 6973 | 745f | 5f39 | 416c | 6c42 | 6c6f | 636b | 7346 | 7620 | 6765 | 745f | 4655 | 4c69 | 7374 | 5f5f | 3941 | 6c6c | 426c | 6f63 |
| 2660020 | 6b73 | 4676 | 2052 | 6561 | 645f | 5648 | 444c | 5f42 | 6c6b | 4669 | 6c65 | 5f5f | 3941 | 6c6c | 426c | 6f63 | 6b73 | 4650 | 6320 | 5c00 | 5265 | 7665 | 7273 | 6550 |
| 2660100 | 6172 | 616d | 4c69 | 7374 | 735f | 5f39 | 416c | 6c42 | 6c6f | 636b | 7346 | 7620 | 6d61 | 6b65 | 5f44 | 554c | 6973 | 745f | 5f39 | 416c | 6c42 | 6c6f | 636b | 7346 |
| 2660160 | 7620 | 6d61 | 6b65 | 5f46 | 554c | 6973 | 745f | 5f39 | 416c | 6c42 | 6c6f | 636b | 7346 | 7620 | 4578 | 7061 | 6e64 | 5f56 | 4844 | 4c5f | 4655 | 5f5f | 3941 | 6c6c |
| 2660240 | 426c | 6f63 | 6b73 | 4676 | 2065 | 7870 | 6c61 | 696e | 5f5f | 3941 | 6c6c | 426c | 6f63 | 6b73 | 4650 | 6320 | 3b3b | 3b00 | 5f5f | 7074 | 626c | 5f5f | 3941 | 6c6c |
| 2660320 | 426c | 6f63 | 6b73 | 5f5f | 416c | 6c42 | 6c6f | 636b | 735f | 6378 | 783a | 4728 | 302c | 3333 | 2900 | 6578 | 706c | 6169 | 6e5f | 5f39 | 416c | 6c42 | 6c6f | 636b |
| 2660400 | 7346 | 5063 | 3a46 | 2830 | 2c32 | 2900 | 5f5f | 3074 | 6869 | 733a | 7028 | 302c | 3939 | 293d | 2a28 | 302c | 3938 | 2900 | 5f5f | 3073 | 3a70 | 2830 | 2c32 | 3029 |
| 2660460 | 0041 | 6c6c | 426c | 6f63 | 6b73 | 2e63 | 7878 | 005f | 5f30 | 7468 | 6973 | 3a72 | 2830 | 2c39 | 3929 | 005f | 5f30 | 7468 | 6973 | 203a | 5a74 | 6c00 | 5f5f | 3073 |
| 2660540 | 203a | 5a74 | 6c00 | 6578 | 706c | 6169 | 6e5f | 5f39 | 416c | 6c42 | 6c6f | 636b | 7346 | 5063 | 203a | 5a74 | 4600 | 6d61 | 6b65 | 5f44 | 554c | 6973 | 745f | 5f39 |
| 2660620 | 416c | 6c42 | 6c6f | 636b | 7346 | 763a | 4628 | 302c | 3229 | 005f | 5f30 | 7468 | 6973 | 3a70 | 2830 | 2c39 | 3929 | 005f | 5f30 | 7468 | 6973 | 3a72 | 2830 | 2c39 |
| 2660700 | 3929 | 005f | 5f31 | 4c3a | 2830 | 2c37 | 3729 | 005f | 5f31 | 743a | 2830 | 2c31 | 3030 | 293d | 2a28 | 302c | 3738 | 2900 | 5f5f | 3142 | 3a28 | 302c | 3130 | 3129 |
| 2660760 | 3d2a | 2830 | 2c39 | 3329 | 005f | 5f31 | 453a | 2830 | 2c39 | 3529 | 005f | 5f31 | 443a | 2830 | 2c31 | 3032 | 293d | 2a28 | 302c | 3936 | 2900 | 5f5f | 3157 | 6861 |
| 2661040 | 744c | 6973 | 7450 | 7472 | 3a28 | 302c | 3130 | 3329 | 3d2a | 2830 | 2c38 | 3129 | 005f | 5f30 | 5f5f | 5874 | 6869 | 7330 | 3079 | 7571 | 7965 | 653a | 2830 | 2c31 |
| 2661120 | 3030 | 2900 | 5f5f | 305f | 5f58 | 7468 | 6973 | 3030 | 6175 | 6f79 | 6b67 | 3a28 | 302c | 3737 | 2900 | 5f5f | 305f | 5f58 | 6f30 | 3061 | 756f | 796b | 673a | 2830 |
| 2661200 | 2c37 | 3729 | 005f | 5f30 | 7468 | 6973 | 203a | 5a74 | 6c00 | 5f5f | 314c | 203a | 5a74 | 6c00 | 5f5f | 3174 | 203a | 5a74 | 6c00 | 5f5f | 3142 | 203a | 5a74 | 6c00 |
| 2661260 | 5f5f | 3145 | 203a | 5a74 | 6c00 | 5f5f | 3144 | 203a | 5a74 | 6c00 | 5f5f | 3157 | 6861 | 744c | 6973 | 7450 | 7472 | 203a | 5a74 | 6c00 | 5f5f | 305f | 5f58 | 7468 |
| 2661340 | 6973 | 3030 | 7975 | 7179 | 6565 | 203a | 5a74 | 6c00 | 5f5f | 305f | 5f58 | 7468 | 6973 | 3030 | 6175 | 6f79 | 6b67 | 203a | 5a74 | 6c00 | 5f5f | 305f | 5f58 | 6f30 |
| 2661420 | 3061 | 756f | 796b | 6720 | 3a5a | 746c | 005f | 5f31 | 4c49 | 3a28 | 302c | 3832 | 2900 | 5f5f | 314c | 4920 | 3a5a | 746c | 006d | 616b | 655f | 4455 | 4c69 | 7374 |
| 2661500 | 5f5f | 3941 | 6c6c | 426c | 6f63 | 6b73 | 4676 | 203a | 5a74 | 4600 | 5f5f | 6374 | 5f5f | 3846 | 696c | 6555 | 6e69 | 7446 | 5063 | 3a66 | 2830 | 2c31 | 3034 | 293d |
| 2661560 | 2a28 | 302c | 3937 | 2900 | 5f5f | 3074 | 6869 | 733a | 7028 | 302c | 3130 | 3429 | 005f | 5f30 | 733a | 7028 | 302c | 3230 | 2900 | 2e2f | 6878 | 782f | 4669 | 6c65 |
| 2661640 | 556e | 2e68 | 7878 | 005f | 5f30 | 7468 | 6973 | 203a | 5a74 | 6c00 | 5f5f | 3073 | 203a | 5a74 | 6c00 | 5f5f | 6374 | 5f5f | 3846 | 696c | 6555 | 6e69 | 7446 | 5063 |
| 2661720 | 203a | 5a74 | 4600 | 6d61 | 6b65 | 5f46 | 554c | 6973 | 745f | 5f39 | 416c | 6c42 | 6c6f | 636b | 7346 | 763a | 4628 | 302c | 3229 | 005f | 5f30 | 7468 | 6973 | 3a70 |
| 2662000 | 2830 | 2c39 | 3929 | 0041 | 6c6c | 426c | 6f63 | 6b73 | 2e63 | 7878 | 005f | 5f30 | 7468 | 6973 | 3a72 | 2830 | 2c39 | 3929 | 005f | 5f31 | 4c3a | 2830 | 2c37 | 3729 |
| 2662060 | 005f | 5f31 | 743a | 2830 | 2c31 | 3030 | 2900 | 5f5f | 3144 | 3a28 | 302c | 3130 | 3229 | 005f | 5f31 | 463a | 2830 | 2c31 | 3034 | 2900 | 5f5f | 305f | 5f58 | 7468 |
| 2662140 | 6973 | 3030 | 7975 | 7179 | 6c6a | 3a28 | 302c | 3130 | 3029 | 005f | 5f30 | 5f5f | 5874 | 6869 | 7330 | 3061 | 756f | 796b | 673a | 2830 | 2c37 | 3729 | 005f | 5f30 |
| 2662220 | 5f5f | 586f | 3030 | 6175 | 6f79 | 6b67 | 3a28 | 302c | 3737 | 2900 | 5f5f | 3074 | 6869 | 7320 | 3a5a | 746c | 005f | 5f31 | 4c20 | 3a5a | 746c | 005f | 5f31 | 7420 |
| 2662300 | 3a5a | 746c | 005f | 5f31 | 4420 | 3a5a | 746c | 005f | 5f31 | 4620 | 3a5a | 746c | 005f | 5f30 | 5f5f | 5874 | 6869 | 7330 | 3079 | 7571 | 796c | 6a20 | 3a5a | 746c |
| 2662360 | 005f | 5f30 | 5f5f | 5874 | 6869 | 7330 | 3061 | 756f | 796b | 6720 | 3a5a | 746c | 005f | 5f30 | 5f5f | 586f | 3030 | 6175 | 6f79 | 6b67 | 203a | 5a74 | 6c00 | 5f5f |
| 2662440 | 314c | 493a | 2830 | 2c38 | 3229 | 005f | 5f31 | 4c49 | 203a | 5a74 | 6c00 | 6d61 | 6b65 | 5f46 | 554c | 6973 | 745f | 5f39 | 416c | 6c42 | 6c6f | 636b | 7346 | 7620 |
| 2662520 | 3a5a | 7446 | 0052 | 6576 | 6572 | 7365 | 5061 | 7261 | 6d4c | 6973 | 7473 | 5f5f | 3941 | 6c6c | 426c | 6f63 | 6b73 | 4676 | 3a46 | 2830 | 2c32 | 2900 | 5f5f | 3074 |
| 2662600 | 6869 | 733a | 7028 | 302c | 3939 | 2900 | 5f5f | 3074 | 6869 | 733a | 7228 | 302c | 3939 | 2900 | 5f5f | 314c | 3a28 | 302c | 3737 | 2900 | 5f5f | 3142 | 3a28 | 302c |
| 2662660 | 3130 | 3129 | 005f | 5f30 | 7468 | 6973 | 203a | 5a74 | 6c00 | 5f5f | 314c | 203a | 5a74 | 6c00 | 5f5f | 3142 | 203a | 5a74 | 6c00 | 5265 | 7665 | 7273 | 6550 | 6172 |
| 2662740 | 616d | 4c69 | 7374 | 735f | 5f39 | 416c | 6c42 | 6c6f | 636b | 7346 | 7620 | 3a5a | 7446 | 0045 | 7870 | 616e | 645f | 5648 | 444c | 5f46 | 555f | 5f39 | 416c | 6c42 |
| 2663020 | 6c6f | 636b | 7346 | 763a | 4628 | 302c | 3229 | 005f | 5f30 | 7468 | 6973 | 3a70 | 2830 | 2c39 | 3929 | 005f | 5f30 | 7468 | 6973 | 3a72 | 2830 | 2c39 | 3929 | 005f |

```
2663100 5f31 4c3a 2830 2c37 3729 005f 5f31 463a 2830 2c31 3034 2900 5f5f 3074 6869 7320 3a5a 746c 005f 5f31 4c20 3a5a 746c 005f
2663160 5f31 4620 3a5a 746c 0045 7870 616e 645f 5648 444c 5f46 555f 5f39 416c 6c42 6c6f 636b 7346 7620 3a5a 7446 005f 5f73 7469
2663240 5f5f 416c 6c42 6c6f 636b 735f 6378 785f 6578 706c 6169 6e5f 3a46 2830 2c32 2900 2f75 7372 2f43 432f 7375 6e34 2f69 6e63
2663320 6c2f 696f 7374 7265 616d 2e68 005f 5f73 7464 5f5f 416c 6c42 6c6f 636b 735f 6378 785f 6579 706c 6169 6e5f 3a46 2830 2c32
2663400 2900 5f5f 7674 626c 5f5f 3941 6c6c 426c 6f63 6b73 3a47 2830 2c31 3035 293d 6172 2830 2c31 293b 303b 3130 3b28 302c 3135
2663460 2900 5f5f 7674 626c 5f5f 384c 504f 626a 6563 745f 5f41 6c6c 426c 6f63 6b73 5f63 7878 3a47 2830 2c31 3036 293d 6172 2830
2663540 2c31 293b 303b 333b 2830 2c31 3529 0073 6574 5f46 555f 4669 6c65 4e61 6d65 5f5f 3846 696c 6555 6e69 7446 5063 3a66 2830
2663620 2c32 2900 5f5f 3074 6869 733a 7028 302c 3130 3429 005f 5f30 733a 7028 302c 3230 2900 2e2f 6878 782f 4669 6c65 556e 2e68
2663700 7878 005f 5f30 7468 6973 3a72 2830 2c31 3034 2900 5f5f 3074 6869 7320 3a5a 746c 005f 5f30 7320 3a5a 746c 0073 6574 5f46
2663760 555f 4669 6c65 4e61 6d65 5f5f 3846 696c 6555 6e69 7446 5063 203a 5a74 4600 6578 706c 6169 6e5f 5f38 4c50 4f62 6a65 6374
2664040 4650 633a 6628 302c 3229 005f 5f30 7468 6973 3a70 2830 2c31 3030 2900 5f5f 3073 3a70 2830 2c32 3029 002f 686f 6d65 2f6f
2664120 7361 7331 2f61 2f61 622f 7372 632f 6e65 776f 626a 6563 7473 2f68 7878 2f4c 504f 626a 6563 745f 6452 2e68 7878 005f 5f30
2664200 7468 6973 3a72 2830 2c31 3030 2900 5f5f 3074 6869 7320 3a5a 746c 005f 5f30 7320 3a5a 746c 0065 7870 6c61 696e 5f5f 384c
2664260 504f 626a 6563 7446 5063 203a 5a74 4600 6973 4c54 455f 5f37 4e4f 626a 6563 7446 5036 4f62 6a65 6374 3a66 2830 2c31 2900
2664340 5f5f 3074 6869 733a 7028 302c 3739 2900 5f5f 305f 5f41 3339 3a70 2830 2c31 3037 293d 2a28 302c 3732 2900 2f68 6f6d 652f
2664420 6f73 6173 312f 612f 6162 2f73 7263 2f6e 6577 6f62 6a65 6374 732f 6878 782f 4e4f 626a 6563 745f 6462 2e68 7878 005f 5f30
2664500 7468 6973 203a 5a74 6c00 5f5f 305f 5f41 3339 203a 5a74 6c00 6973 4c54 455f 5f37 4e4f 626a 6563 7446 5036 4f62 6a65 6374
2664560 203a 5a74 4600 6973 4754 455f 5f37 4e4f 626a 6563 7446 5036 4f62 6a65 6374 3a66 2830 2c31 2900 5f5f 3074 6869 733a 7028
2664640 302c 3739 2900 5f5f 305f 5f41 3338 3a70 2830 2c31 3037 2900 5f5f 3074 6869 7320 3a5a 746c 005f 5f30 5f5f 4133 3820 3a5a
2664720 746c 0069 7347 5445 5f5f 374e 4f62 6a65 6374 4650 364f 626a 6563 7420 3a5a 7446 0073 6574 5072 6f70 5f5f 374e 4f62 6a65
2665000 6374 4650 6366 3a66 2830 2c32 2900 5f5f 3074 6869 733a 7028 302c 3739 2900 5f5f 315f 5f41 3336 3a70 2830 2c32 3029 005f
2665060 5f31 5f5f 4133 373a 7028 302c 3130 2300 5f5f 3074 6869 7320 3a5a 746c 005f 5f31 5f5f 4133 3620 3a5a 746c 005f 5f31 5f5f
2665140 4133 3720 3a5a 746c 0073 6574 5072 6f70 5f5f 374e 4f62 6a65 6374 4650 6366 203a 5a74 4600 7365 7450 726f 705f 5f37 4e4f
2665220 626a 6563 7446 5063 693a 6628 302c 3229 005f 5f30 7468 6973 3a70 2830 2c37 3929 005f 5f31 5f5f 4133 343a 7028 302c 3230
2665300 2900 5f5f 315f 5f41 3335 3a70 2830 2c31 2900 5f5f 3074 6869 7320 3a5a 746c 005f 5f31 5f5f 4133 3420 3a5a 746c 005f 5f31
2665360 5f5f 4133 3520 3a5a 746c 0073 6574 5072 6f70 5f5f 374e 4f62 6a65 6374 4650 6369 203a 5a74 4600 7365 7450 726f 705f 5f37
2665440 4e4f 626a 6563 7446 5063 5431 3366 2830 2c32 2900 5f5f 3074 6869 733a 7028 302c 3739 2900 5f5f 315f 5f41 3332 3a70 2830
2665520 2c32 3029 005f 5f31 5f5f 4133 333a 7028 302c 3230 2900 5f5f 3074 6869 7320 3a5a 746c 005f 5f31 5f5f 4133 3220 3a5a 746c
2665600 005f 5f31 5f5f 4133 3320 3a5a 746c 0073 6574 5072 6f70 5f5f 374e 4f62 6a65 6374 4650 6354 3120 3a5a 7446 0067 6574 5072
2665660 6f70 5f5f 374e 4f62 6a65 6374 4650 6369 3a66 2830 2c32 3029 005f 5f30 7468 6973 3a70 2830 2c37 3929 005f 5f30 5f5f 4133
2665740 303a 7028 302c 3230 2900 5f5f 305f 5f41 3331 3a70 2830 2c31 2900 5f5f 3074 6869 7320 3a5a 746c 005f 5f30 5f5f 4133 3020
2666020 3a5a 746c 005f 5f30 5f5f 4133 3120 3a5a 746c 0067 6574 5072 6f70 5f5f 374e 4f62 6a65 6374 4650 6369 203a 5a74 4600 6765
2666100 7441 7474 725f 5f37 4e4f 626a 6563 7446 693a 6628 302c 3230 2900 5f5f 3074 6869 733a 7028 302c 3739 2900 5f5f 305f 5f41
2666160 3239 3a70 2830 2c31 2900 5f5f 3074 6869 7320 3a5a 746c 005f 5f30 5f5f 4132 3920 3a5a 746c 0067 6574 4174 7472 5f5f 374e
2666240 4f62 6a65 6374 4669 203a 5a74 4600 696e 4f72 6465 725f 5f36 4f62 6a65 6374 4650 364f 626a 6563 743a 6628 302c 3129 005f
2666320 5f30 7468 6973 3a70 2830 2c31 3037 2900 5f5f 395f 5f41 3237 3a70 2830 2c31 3037 2900 2f68 6f6d 652f 6f73 6173 312f 612f
2666400 6162 2f73 7263 2f6e 6577 6f62 6a65 6374 732f 6878 782f 4f62 6a65 6374 5f64 622e 6878 7800 5f5f 3074 6869 7320 3a5a 746c
2666460 005f 5f30 5f5f 4132 3720 3a5a 746c 0069 6e4f 7264 6572 5f5f 354f 626a 6563 7446 5036 4f62 6a65 6374 203a 5a74 4600 416c
2666540 6c42 6c6f 636b 735f 312e 6f00 5f73 6574 5f70 6172 616d 6574 6572 5f76 616c 7565 5f74 7970 655f 5f39 7061 7261 6d65 7465
2666620 7246 5063 005f 7365 7450 726f 705f 5f37 4e4f 626a 6563 7446 5063 6600 5f73 6574 5072 6f70 5f5f 374e 4f62 6a65 6374 4650
2666700 6369 005f 6578 706c 6169 6e5f 5f31 3662 6c6f 636b 5f61 7474 7269 6275 7465 7346 5063 005f 6765 7441 7474 725f 5f37 4e4f
2666760 626a 6563 7446 6900 5f5f 5f63 745f 5f31 3662 6c6f 636b 5f61 7474 7269 6275 7465 7346 5063 005f 7365 745f 4655 5f46 696c
2667040 654e 616d 655f 5f38 4669 6c65 556e 6974 4650 6300 5f70 7574 5f5f 376f 7374 7265 616d 4663 005f 7365 7450 726f 705f 5f37
2667120 4e4f 626a 6563 7446 5063 5431 005f 6d61 5f69 6400 5f6c 7369 6770 616c 6964 005f 6c73 696e 6873 6869 6400 5f69 6f73 7472
2667200 6561 6d5f 696e 6974 005f 5f5f 6374 5f5f 3562 6c6f 636b 4676 005f 6973 4c54 455f 5f37 4e4f 626a 6563 7446 5036 4f62 6a65
2667260 6374 005f 6973 4754 455f 5f37 4e4f 626a 6563 7446 5036 4f62 6a65 6374 005f 6578 706c 6169 6e5f 5f38 4c50 4f62 6a65 6374
2667340 4650 6300 5f5f 5f63 745f 5f39 7061 7261 6d65 7465 7246 7600 5f67 6574 5072 6f70 5f5f 374e 4f62 6a65 6374 4650 6369 005f
2667420 5f5f 6374 5f5f 3665 6e74 6974 7946 7600 5f69 6e4f 7264 6572 5f5f 364f 626a 6563 7446 5036 4f62 6a65 6374 002f 686f 6d65
2667500 2f6f 7361 7331 2f61 2f61 622f 7372 632f 6e65 776f 626a 6563 7473 2f70 726f 672f 432b 2b2e 3232 3535 322f 0041 6c6c 426c
2667560 6f63 6b73 5f31 2e63 0041 6c6c 426c 6f63 6b73 5f31 2e63 7878 0069 6e74 3a74 2830 2c31 293d 7228 302c 3129 3b2d 3231 3437
2667640 3438 3336 3438 3b32 3134 3734 3833 3634 373b 0063 6861 723a 7428 302c 3229 3d72 2830 2c32 293b 303b 3132 373b 006c 6f6e
2667720 673a 7428 302c 3329 3d72 2830 2c31 293b 2d32 3134 3734 3833 3634 383b 3231 3437 3438 3336 3437 3b00 7368 6f72 743a 7428
2670000 302c 3429 3d72 2830 2c31 293b 2133 3237 3638 3b33 3237 3637 3b00 756e 7369 676e 6564 2063 6861 723a 7428 302c 3529 3d72
2670060 2830 2c31 293b 303b 3235 353b 0075 6e73 6967 6e65 6420 7368 6f72 743a 7428 302c 3629 3d72 2830 2c31 293b 303b 3635 3533
2670140 353b 0075 6e73 6967 6e65 6420 6c6f 6e67 3a74 2830 2c37 293d 7228 302c 3129 3b30 3b2d 313b 0075 6e73 6967 6e65 6420 696e
```

```
2670220  743a 7428 302c 3829 3d72 2830 2c31 293b 303b 2d31 3b00 666c 6f61 743a 7428 302c 3929 3d72 2830 2c31 293b 343b 303b 0064
2670300  6f75 626c 653a 7428 302c 3130 293d 7228 302c 3129 3b38 3b30 3b00 766f 6964 3a74 2830 2c31 3129 3d28 302c 3131 2900 3f3f
2670360  3f3a 7428 302c 3132 293d 2830 2c31 2900 5f5f 7670 7470 3a74 2830 2c31 3329 3d2a 2830 2c31 3429 3d66 2830 2c31 2900 5f5f
2670440  6d70 7472 3a54 2830 2c31 3529 3d73 3864 3a28 302c 3429 2c30 2c31 363b 693a 2830 2c34 292c 3136 2c31 363b 663a 2830 2c31
2670520  3329 2c33 322c 3332 3b3b 005f 5046 565f 3a74 2830 2c31 3629 342a 2830 2c31 3729 3d66 2830 2c32 2900 5f50 4649 5f3a 7428
2670600  302c 3133 2900 6572 726e 6f3a 4728 302c 3129 0073 7973 5f6e 6572 723a 4728 302c 3129 006c 7369 6e58 7368 6964 3a53 2830
2670660  2c31 3929 3d61 7228 302c 3129 3b30 3b35 393b 2830 2c32 2900 2f68 6f6d 652f 6f73 6173 312f 612f 6162 2f73 7263 2f6e 6577
2670740  6f62 6a65 6374 732f 696e 636c 7564 652f 6c73 696e 6973 682e 6800 6c73 6967 7061 6c69 643a 5328 302c 3230 293d 6172 2830
2671020  2c31 293b 303b 3632 3b28 302c 3229 002f 686f 6d65 2f6f 7361 7331 2f61 2f61 622f 7372 632f 6e65 776f 626a 6563 7473 2f69
2671100  6e63 6c75 6465 2f6c 7369 6770 616c 2e68 006d 615f 6964 3a53 2830 2c32 3129 3d61 7228 302c 3129 3b30 3b36 363b 2830 2c32
2671160  2900 2f68 6f6d 652f 6f73 6173 312f 612f 6162 2f73 7263 2f6e 6577 6f62 6a65 6374 732f 696e 636c 7564 652f 6d61 2e68 0070
2671240  6f69 6e74 6572 3a74 2830 2c32 3229 3d2a 2830 2c32 3329 3d61 7228 302c 3129 3b30 3b30 3b28 302c 3234 293d 6172 2830 2c31
2671320  293b 303b 303b 2830 2c32 3529 3d61 7228 302c 3129 3b30 3b30 3b28 302c 3236 293d 6172 2830 2c31 293b 303b 303b 2830 2c32
2671400  3729 3d61 7228 302c 3129 3b30 3b30 3b28 302c 3238 293d 6172 2830 2c31 293b 303b 303b 2830 2c32 2900 626f 6f6c 6561 6e3a
2671460  7428 302c 3129 006d 615f 6772 6f75 703a 7428 302c 3330 293d 2a28 302c 3239 293d 7873 5f5f 4331 3a00 6675 6e63 7469 6f6e
2671540  3a74 2830 2c31 3329 0c6d 656d 5f61 6c6c 6f63 6174 6564 3a47 2830 2c31 2900 6d65 6d5f 7573 6564 3a47 2830 2c31 2900 6f75
2671620  745f 6f66 5f6d 656d 6f72 795f 6675 6e63 7469 6f6e 3a47 2830 2c31 3329 0069 745f 7461 626c 653a 7428 302c 3332 293d 2a28
2671700  302c 3331 293d 7873 5f5f 4332 3a00 6861 7368 5f74 6162 6c65 3a74 2830 2c33 3229 0074 7374 7265 616d 3a74 2830 2c33 3329
2671760  3d2a 2830 2c32 2900 5661 6c75 655f 5479 7065 3a54 2830 2c33 3429 3d65 554e 4b4e 4f57 4e56 3a30 2c53 5452 494e 473a 312c
2672040  494e 5445 4745 523a 322c 464c 4f41 543a 332c 3b00 426c 6f63 6b5f 5479 7065 3a54 2830 2c33 3529 3d65 554e 4b4e 4f57 4e42
2672120  3a30 2c45 4e54 4954 593a 312c 4655 4e43 5449 4f4e 3a32 2c50 524f 4345 4455 5245 3a33 2c3b 0045 6e74 6974 795f 5479 7065
2672200  3a54 2830 2c33 3629 3d65 554e 4b4e 4f57 4e45 3a30 2c41 5243 4849 5445 4354 5552 453a 312c 5355 4250 524f 4752 414d 3a32
2672260  2c3b 0050 696e 5f54 7970 653a 5428 302c 3337 293d 6555 4e4b 4e4f 574e 503a 302c 494e 5049 4e3a 312c 4f55 5450 494e 3a32
2672340  2c49 4e4f 5554 5049 4e3a 332c 3b00 5061 7261 5f43 6c61 7373 3a54 2830 2c33 3829 3d65 554e 4b4e 4f57 4e43 3a30 2c46 4f52
2672420  4d41 4c3a 312c 4143 5455 414c 3a32 2c52 4553 4f4c 5645 443a 332c 3b00 424f 4f4c 4541 4e3a 5428 302c 3339 293d 6546 616c
2672500  7365 3a30 2c54 7275 653a 312c 3b00 426f 6f6c 6561 6e3a 5428 302c 3430 293d 6566 616c 7365 3a30 2c74 7275 653a 312c 3b00
2672560  4275 6666 6572 3a47 2830 2c33 3329 0073 7472 6561 6170 6f73 3a74 2830 2c31 2900 7374 7265 616d 6f66 663a 7428 302c 3129
2672640  0069 6f5f 7374 6174 653a 5428 302c 3431 293d 6567 6f6f 6462 6974 5f5f 696f 5f73 7461 7465 3a30 2c65 6f66 6269 745f 5f69
2672720  6f5f 7374 6174 653a 312c 6661 696c 6269 745f 5f69 6f5f 7374 6174 653a 322c 6261 6462 6974 5f5f 696f 5f73 7461 7465 3a33
2673000  2c68 6172 6466 6169 6c5f 5f69 6f5f 7374 6174 653a 342c 3b00 6f70 656e 5f6d 6f64 653a 5428 302c 3432 293d 6569 6e5f 5f6f
2673060  7065 6e5f 6d6f 6465 3a30 2c6f 7574 5f5f 6f70 656e 5f6d 6f64 653a 312c 6174 655f 5f6f 7065 6e5f 6d6f 6465 3a32 2c61 7070
2673140  5f5f 6f70 656e 5f6d 6f64 653a 332c 7472 756e 635f 5f6f 7065 6e5f 6d6f 6465 3a34 2c6e 6f63 7265 6174 655f 5f6f 7065 6e5f
2673220  6d6f 6465 3a35 2c6e 6f72 6570 6c61 6365 5f5f 6f70 656e 5f6d 6f64 653a 362c 3b00 7365 656b 5f64 6972 3a54 2830 2c34 3329
2673300  3d65 6265 675f 5f73 6565 6b5f 6469 723a 302c 6375 725f 5f73 6565 6b5f 6469 723a 312c 656e 645f 5f73 6565 6b5f 6469 723a
2673360  322c 3b00 5f5f 4533 3a54 2830 2c34 3429 3d65 736b 6970 7773 5f5f 5f5f 4533 3a30 2c6c 6566 745f 5f5f 5f45 333a 312c 7269
2673440  6768 745f 5f5f 5f45 333a 322c 696e 7465 726e 616c 5f5f 5f5f 4533 3a33 2c64 6563 5f5f 5f5f 4533 3a34 2c6f 6374 5f5f 5f5f
2673520  4533 3a35 2c68 6578 5f5f 5f5f 4533 3a36 2c73 686f 7762 6173 655f 5f5f 5f45 333a 372c 5c00 7368 6f77 706f 696e 745f 5f5f
2673600  5f45 333a 382c 7570 7065 7263 6173 655f 5f5f 5f45 333a 392c 7368 6f77 706f 735f 5f5f 5f45 333a 3130 2c73 6369 656e 7469
2673660  6669 635f 5f5f 5f45 333a 3131 2c66 6978 6564 5f5f 5f5f 4533 3a31 322c 756e 6974 6275 665f 5f5f 5f45 333a 3133 2c73 7464
2673740  696f 5f5f 5f5f 4533 3a31 342c 3b00 5f5f 4534 3a54 2830 2c34 3529 3d65 736b 6970 7069 6e67 5f5f 5f5f 4534 3a30 2c74 6965
2674020  645f 5f5f 5f45 343a 312c 3b00 696f 733a 5428 302c 3436 293d 7336 306e 7573 6572 5f5f 3369 6f73 3a28 302c 3129 2c30 2c33
2674100  323b 785f 7573 6572 5f5f 3369 6f73 3a28 302c 3530 293d 2a28 302c 3437 293d 7875 696f 735f 7573 6572 5f75 6e69 6f6e 3a2c
2674160  3332 2c33 323b 6270 5f5f 3369 6f73 3a28 302c 3531 293d 2a28 302c 3438 293d 7873 7374 7265 616d 6275 663a 2c36 342c 3332
2674240  3b73 7461 7465 5f5f 3369 6f73 3a28 302c 3129 2c39 362c 3332 3b69 7370 6563 6961 6c5f 5f33 696f 733a 2830 2c31 292c 3132
2674320  382c 3332 3b6f 7370 6563 6961 6c5f 5f33 696f 733a 2830 2c31 292c 3136 302c 3332 3b69 7366 785f 7370 6563 6961 6c5f 5f33
2674400  696f 733a 2830 2c31 292c 3139 322c 3332 3b6f 7366 785f 7370 6563 6961 6c5f 5f33 696f 733a 2930 2c31 292c 3232 342c 3332
2674460  3b5c 0064 656c 6275 665f 5f33 696f 733a 2830 2c31 292c 3235 362c 3332 3b78 5f74 6965 5f5f 3369 6f73 3a28 302c 3532 293d
2674540  2a28 302c 3439 293d 7873 6f73 7472 6561 6d3a 2c32 3838 2c33 323b 785f 666c 6167 735f 5f33 696f 733a 2830 2c31 292c 3332
2674620  302c 3332 3b78 5f70 7265 6369 7369 6f6e 5f5f 3369 6f73 3a28 302c 3429 2c33 3532 2c31 363b 785f 6669 6c6c 5f5f 3369 6f73
2674700  3a28 302c 3229 2c33 3638 2c39 3b78 5f77 6964 7468 5f5f 3369 6f73 3a28 302c 3429 2c33 3834 2c31 363b 6173 7369 676e 5f70
2674760  7269 7661 7465 5f5f 3369 6f73 3a28 302c 3129 2c34 3136 2c33 323b 5f5f 7670 7472 5f5f 3369 6f73 3a28 302c 3533 293d 2a28
2675040  302c 3135 292c 3434 382c 3332 3b3b 0062 6173 6566 6965 6c64 5f5f 3369 6f73 3a47 2830 2c31 2900 6164 6a75 7374 6669 656c
2675120  645f 5f33 696f 733a 4728 302c 3129 0066 6c6f 6174 6669 656c 645f 5f33 696f 733a 4728 302c 3129 006e 6578 7462 6974 5f5f
2675200  3369 6f73 3a47 2830 2c31 2900 6e65 7874 776f 7264 5f5f 3369 6f73 3a47 2830 2c31 2900 7374 6469 6f66 6c75 7368 5f5f 3369
2675260  6f73 3a47 2830 2c31 3629 0069 6f73 3a5a 6369 6f73 3b3b 5f5f 6374 5f5f 3369 6f73 4650 3973 7472 6561 6d62 7566 205f 5f63
```

```
2675340  745f 5f33 696f 7346 7620 5f5f 6374 5f5f 3369 6f73 4652 3369 6f73 205f 5f64 745f 5f33 696f 7346 7620 666c 6167 735f 5f33
2675420  696f 7346 7620 666c 6167 735f 5f33 696f 7346 6c20 7365 7466 5f5f 3369 6f73 466c 5431 2073 6574 665f 5f33 696f 7346 6c20
2675500  756e 7365 7466 5f5f 3369 6f73 466c 2077 6964 7468 5f5f 3369 6f73 4676 2077 6964 7468 5f5f 3369 6f73 4669 2074 6965 5f5f
2675560  3369 6f73 4650 376f 7374 7265 616d 205c 0074 6965 5f5f 3369 6f73 4676 2066 696c 6c5f 5f33 696f 7346 6320 6669 6c6c 5f5f
2675640  3369 6f73 4676 2070 7265 6369 7369 6f6e 5f5f 3369 6f73 4669 2070 7265 6369 7369 6f6e 5f5f 3369 6f73 4676 2072 6473 7461
2675720  7465 5f5f 3369 6f73 4676 205f 5f6f 7050 765f 5f33 696f 7346 7620 5f5f 6e74 5f5f 3369 6f73 4676 2065 6f66 5f5f 3369 6f73
2676000  4676 2066 6169 6c5f 5f33 696f 7346 7620 6261 645f 5f33 696f 7346 7620 676f 6f64 5f5f 3369 6f73 4676 2063 6c65 6172 5f5f
2676060  3369 6f73 4669 2072 6462 7566 5f5f 3369 6f73 4676 205c 0069 776f 7264 5f5f 3369 6f73 4669 2070 776f 7264 5f5f 3369 6f73
2676140  4669 2062 6974 616c 6c6f 635f 5f33 696f 7353 4676 2078 616c 6c6f 635f 5f33 696f 7353 4676 2075 7265 7369 7a65 5f5f 3369
2676220  6f73 4669 2073 796e 635f 7769 7468 5f73 7464 696f 5f5f 3369 6f73 5346 7620 7365 7473 7461 7465 5f5f 3369 6f73 4669 2069
2676300  6e69 745f 5f33 696f 7346 5039 7374 7265 616d 6275 6620 5f5f 6173 5f5f 3369 6f73 4652 3369 6f73 2073 6b69 705f 5f33 696f
2676360  7346 6920 3b62 6173 6566 6965 6c64 5f5f 3369 6f73 205c 0061 646a 7573 7466 6965 6c64 5f5f 3369 6f73 2066 6c6f 6174 6669
2676440  656c 645f 5f33 696f 7320 6e65 7874 6269 745f 5f33 696f 7320 6e65 7874 776f 7264 5f5f 3369 6f73 2073 7464 696f 666c 7573
2676520  685f 5f33 696f 7320 3b3b 0073 7472 6561 6d62 7566 3a54 2830 2c34 3829 3d73 3430 616c 6c6f 635f 5f39 7374 7265 616d 6275
2676600  663a 2830 2c34 292c 302c 3136 3b78 5f75 6e62 7566 5f5f 3973 7472 6561 6d62 7566 3a28 302c 3429 2c31 362c 3136 3b78 5f62
2676660  6173 655f 5f39 7374 7265 616d 6275 663a 2830 2c33 3329 2c33 322c 3332 3b78 5f70 6261 7365 5f5f 3973 7472 6561 6d62 7566
2676740  3a28 302c 3333 292c 3634 2c33 323b 785f 7070 7472 5f5f 3973 7472 6561 6d62 7566 3a28 302c 3333 292c 3936 2c33 323b 785f
2677020  6570 7074 725f 5f39 7374 7265 616d 6275 663a 2830 2c33 3329 2c31 3238 2c33 323b 785f 6770 7472 5f5f 3973 7472 6561 6d62
2677100  7566 3a28 302c 3333 292c 3136 302c 3332 3b78 5f65 6770 7472 5f5f 3973 7472 6561 6d62 7566 3a28 302c 3333 292c 3139 322c
2677160  3332 3b5c 0078 5f65 6261 636b 5f5f 3973 7472 6561 6d62 7566 3a28 302c 3333 292c 3232 342c 3332 3b78 5f62 6c65 6e5f 5f39
2677240  7374 7265 616d 6275 663a 2830 2c31 292c 3235 362c 3332 3b5f 5f76 7074 725f 5f39 7374 7265 616d 6275 663a 2830 2c35 3329
2677320  2c32 3838 2c33 323b 3b00 7374 7265 616d 6275 663a 5a63 7374 7265 616d 6275 663b 3b5f 5f63 745f 5f39 7374 7265 616d 6275
2677400  6646 5239 7374 7265 616d 6275 6620 5f5f 6374 5f5f 3973 7472 6561 6d62 7566 4676 205f 5f63 745f 5f39 7374 7265 616d 6275
2677460  6646 5063 6920 5f5f 6374 5f5f 3973 7472 6561 6d62 7566 4650 6369 5432 205f 5f61 735f 5f39 7374 7265 616d 6275 6646 5239
2677540  7374 7265 616d 6275 6620 6462 705f 5f39 7374 7265 616d 6275 6646 7620 6261 7365 5f5f 3973 7472 6561 6d62 7566 4676 2070
2677620  6261 7365 5f5f 3973 7472 6561 6d62 7566 4676 205c 0070 7074 725f 5f39 7374 7265 616d 6275 6646 7620 6570 7074 725f 5f39
2677700  7374 7265 616d 6275 6646 7620 6770 7472 5f5f 3973 7472 6561 6d62 7566 4676 2065 6770 7472 5f5f 3973 7472 6561 6d62 7566
2677760  4676 2065 6261 636b 5f5f 3973 7472 6561 6d62 7566 4676 2065 6275 665f 5f39 7374 7265 616d 6275 6646 7620 626c 656e 5f5f
2700040  3973 7472 6561 6462 7566 4676 2073 6574 705f 5f39 7374 7265 616d 6275 6646 5063 5431 2073 6574 675f 5f39 7374 7265 616d
2700120  6275 6646 5063 4e32 3120 7062 756d 705f 5f39 7374 7265 616d 6275 6646 6920 5c00 6762 756d 705f 5f39 7374 7265 616d 6275
2700200  6646 6920 7365 7462 5f5f 3973 7472 6561 6d62 7566 4650 6354 3169 2075 6e62 7566 6665 7265 645f 5f39 7374 7265 616d 6275
2700260  6646 7620 756e 6275 6666 6572 6564 5f5f 3973 7472 6561 6d62 7566 4669 2061 6c6c 6f63 6174 655f 5f39 7374 7265 616d 6275
2700340  6646 7620 646f 616c 6c6f 6361 7465 5f5f 3973 7472 6561 6d62 7566 4676 206f 7665 7266 6c6f 775f 5f39 7374 7265 616d 6275
2700420  6646 6920 756e 6465 7266 6c6f 775f 5f39 7374 7265 616d 6275 6646 7620 5c00 7062 6163 6b66 6169 6c5f 5f39 7374 7265 616d
2700500  6275 6646 6920 7379 6e63 5f5f 3973 7472 6561 6d62 7566 4676 2073 6565 6b6f 6666 5f5f 3973 7472 6561 6d62 7566 466c 3873
2700560  6565 6b5f 6469 7269 2073 6565 6b70 6f73 5f5f 3973 7472 6561 6d62 7566 466c 6920 7873 7075 746e 5f5f 3973 7472 6561 6d62
2700640  7566 4650 4363 6920 7873 6765 746e 5f5f 3973 7472 6561 6d62 7566 4650 6369 2069 6e5f 6176 6169 6c5f 5f39 7374 7265 616d
2700720  6275 6646 7620 6f75 745f 7761 6974 696e 675f 5f39 7374 7265 616d 6275 6646 7620 5c00 7367 6574 635f 5f39 7374 7265 616d
2701000  6275 6646 7620 736e 6578 7463 5f5f 3973 7472 6561 6d62 7566 4676 2073 6275 6d70 635f 5f39 7374 7265 616d 6275 6646 7620
2701060  7374 6f73 7363 5f5f 3973 7472 6561 6d62 7566 4676 2073 7075 7462 6163 6b63 5f5f 3973 7472 6561 6d62 7566 4663 2073 7075
2701140  7463 5f5f 3973 7472 6561 6d62 7566 4669 2073 7075 746e 5f5f 3973 7472 6561 6d62 7566 4650 4363 6920 7367 6574 6e5f 5f39
2701220  7374 7265 616d 6275 6646 5063 6920 7365 7462 7566 5f5f 3973 7472 6561 6d62 7566 4650 6369 205c 0073 6574 6275 665f 5f39
2701300  7374 7265 616d 6275 6646 5055 6369 2073 6574 6275 665f 5f39 7374 7265 616d 6275 6646 5063 6954 3220 5f5f 6474 5f5f 3973
2701360  7472 6561 6d62 7566 4676 2078 5f73 6e65 7874 635f 5f39 7374 7265 616d 6275 6646 7620 3b3b 3b00 6373 7472 6561 6d3a 5428
2701440  302c 3534 293d 7337 3278 5f67 636f 756e 745f 5f37 6973 7472 6561 6d3a 2830 2c31 292c 302c 3332 3b5f 5f76 7074 725f 5f37
2701520  6973 7472 6561 6d3a 2830 2c35 3329 2c33 322c 3332 3b50 696f 733a 2830 2c35 3529 3d2a 2830 2c34 3629 2c36 342c 3332 3b4f
2701600  696f 733a 2830 2c34 3629 2c39 362c 3438 303b 3b00 6973 7472 6561 6d3a 5a63 6973 7472 6561 6d3b 696f 733b 5f5f 6374 5f5f
2701660  3769 7374 7265 616d 4650 3973 7472 6561 6d62 7566 205f 5f63 745f 5f37 6973 7472 6561 6d46 7620 5f5f 6374 5f5f 3769 7374
2701740  7265 616d 4650 3973 7472 6561 6d62 7566 6950 376f 7374 7265 616d 205f 5f63 745f 5f37 6973 7472 6561 6d46 6950 6354 3120
2702020  5f5f 6374 5f5f 3769 7374 7265 616d 4669 5431 5037 6f73 7472 6561 6d20 5f5f 6374 5f5f 3769 7374 7265 616d 4652 3769 7374
2702100  7265 616d 205f 5f64 745f 5f37 6973 7472 6561 6d46 7620 5c00 6970 6678 5f5f 3769 7374 7265 616d 4669 2069 7366 785f 5f37
2702160  6973 7472 6561 6d46 7620 7365 656b 675f 5f37 6973 7472 6561 6d46 6c20 7365 656b 675f 5f37 6973 7472 6561 6d46 6c38 7365
2702240  656b 5f64 6972 2074 656c 6c67 5f5f 3769 7374 7265 616d 4676 205f 5f72 735f 5f37 6973 7472 6561 6d46 5046 5237 6973 7472
2702320  6561 6d5f 5237 6973 7472 6561 6d20 5f5f 7273 5f5f 3769 7374 7265 6161 4650 4652 3369 6f73 5f52 3369 6f73 205f 5f72 735f
2702400  5f37 6973 7472 6561 6d46 5063 205f 5f72 735f 5f37 6973 7472 6561 6d46 5055 6320 5c00 5f5f 7273 5f5f 3769 7374 7265 616d
```

```
2702460 4652 5563 205f 5f72 735f 5f37 6973 7472 6561 6d46 5263 205f 5f72 735f 5f37 6973 7472 6561 6d46 5273 205f 5f72 735f 5f37
2702540 6973 7472 6561 6d46 5269 205f 5f72 735f 5f37 6973 7472 6561 6d46 526c 205f 5f72 735f 5f37 6973 7472 6561 6d46 5255 7320
2702620 5f5f 7273 5f5f 3769 7374 7265 616d 4652 5569 205f 5f72 735f 5f37 6973 7472 6561 6d46 5255 6c20 5f5f 7273 5f5f 3769 7374
2702700 7265 616d 4652 6620 5f5f 7273 5f5f 3769 7374 7265 616d 4652 6420 5f5f 7273 5f5f 3769 7374 7265 616d 4650 3973 7472 6561
2702760 6d62 7566 205c 0067 6574 5f5f 3769 7374 7265 616d 4650 6369 6320 6765 745f 5f37 6973 7472 6561 6d46 5055 6369 6320 6765
2703040 745f 5f37 6973 7472 6561 6d46 5239 7374 7265 616d 6275 6663 2067 6574 5f5f 3769 7374 7265 616d 4652 5563 2067 6574 5f5f
2703120 3769 7374 7265 616d 4652 6320 6765 745f 5f37 6973 7472 6561 6d46 7620 6765 746c 696e 655f 5f37 6973 7472 6561 6d46 5063
2703200 6963 2067 6574 6c69 6e65 5f5f 3769 7374 7265 616d 4650 5563 6963 2070 6565 6b5f 5f37 6973 7472 6561 6d46 7620 6967 6e6f
2703260 7265 5f5f 3769 7374 7265 616d 4669 5431 205c 0072 6561 645f 5f37 6973 7472 6561 6d46 5063 6920 7265 6164 5f5f 3769 7374
2703340 7265 616d 4650 5563 6920 6763 6f75 6e74 5f5f 3769 7374 7265 616d 4676 2070 7574 6261 636b 5f5f 3769 7374 7265 616d 4663
2703420 2073 796e 635f 5f37 6973 7472 6561 6d46 7620 646f 5f69 7066 785f 5f37 6973 7472 6561 6d46 6920 6561 7477 6869 7465 5f5f
2703500 3769 7374 7265 616d 4676 2078 6765 745f 5f37 6973 7472 6561 6d46 5063 203b 3b3b 006f 7374 7265 616d 3a54 2830 2c34 3929
2703560 3d73 3638 5f5f 7670 7472 5f5f 376f 7374 7265 616d 3a28 302c 3533 292c 302c 3332 3b50 696f 733a 2830 2c35 3529 2c33 322c
2703640 3332 3b4f 696f 733a 2830 2c34 3629 2c36 342c 3438 303b 3b00 6f73 7472 6561 6d3a 5a63 6f73 7472 6561 6d3b 696f 733b 5f5f
2703720 6374 5f5f 376f 7374 7265 616d 4650 3973 7472 6561 6d62 7566 205f 5f63 745f 5f37 6f73 7472 6561 6d46 7620 5f5f 6374 5f5f
2704000 376f 7374 7265 616d 4669 205f 5f63 745f 5f37 6f73 7472 6561 6d46 6950 6320 5f5f 6374 5f5f 376f 7374 7265 616d 4652 376f
2704060 7374 7265 616d 205f 5f64 745f 5f37 6f73 7472 6561 6d46 7620 6f70 6678 5f5f 376f 7374 7265 616d 4676 206f 7366 785f 5f37
2704140 6f73 7472 6561 6d46 7620 666c 7573 685f 5f37 6f73 7472 6561 6d46 7620 5c00 7365 656b 705f 5f37 6f73 7472 6561 6d46 6c20
2704220 7365 656b 705f 5f37 6f73 7472 6561 6d46 6c38 7365 656b 5f64 6972 2074 656c 6c70 5f5f 376f 7374 7265 616d 4676 2070 7574
2704300 5f5f 376f 7374 7265 616d 4663 205f 5f6c 735f 5f37 6f73 7472 6561 6d46 6320 5f5f 6c73 5f5f 376f 7374 7265 616d 4655 6320
2704360 5f5f 6c73 5f5f 376f 7374 7265 616d 4650 4363 205f 5f6c 735f 5f37 6f73 7472 6561 6d46 6920 5f5f 6c73 5f5f 376f 7374 7265
2704440 616d 466c 205f 5f6c 735f 5f37 6f73 7472 6561 6d46 6420 5f5f 6c73 5f5f 376f 7374 7265 616d 4666 205c 005f 5f6c 735f 5f37
2704520 6f73 7472 6561 6d46 5569 205f 5f6c 735f 5f37 6f73 7472 6561 6d46 556c 205f 5f6c 735f 5f37 6f73 7472 6561 6d46 5076 205f
2704600 5f6c 735f 5f37 6f73 7472 6561 6d46 5039 7374 7265 616d 6275 6620 5f5f 6c73 5f5f 376f 7374 7265 616d 4673 205f 5f6c 735f
2704660 5f37 6f73 7472 6561 6d46 5573 205f 5f6c 735f 5f37 6f73 7472 6561 6d46 5046 5237 6f73 7472 6561 6d5f 5237 6f73 7472 6561
2704740 6d20 5f5f 6c73 5f5f 376f 7374 7265 616d 4650 4652 3369 6f73 5f52 3369 6f73 2077 7269 7465 5f5f 376f 7374 7265 616d 4650
2705020 4363 6920 5c00 7772 6974 655f 5f37 6f73 7472 6561 6d46 5043 5563 6920 646f 5f6f 7066 785f 5f37 6f73 7472 6561 6d46 7620
2705100 646f 5f6f 7366 785f 5f37 6f73 7472 6561 6d46 7620 3b3b 3b00 7075 745f 5f37 6f73 7472 6561 6d46 633a 6628 302c 3536 293d
2705160 2a28 302c 3439 2900 5f5f 3074 6969 733a 7028 302c 3536 2900 5f5f 3063 3a70 2830 2c32 2900 2f75 7372 2f43 432f 7375 6e34
2705240 2f69 6e63 6c2f 696f 7374 7265 616d 2e68 005f 5f30 7468 6973 3a72 2830 2c35 3629 005f 5f30 7468 6973 203a 5a74 6c00 5f5f
2705320 3063 203a 5a74 6c00 7075 745f 5f37 6f73 7472 6561 6d46 6320 3a5a 7446 0069 6f73 7472 6561 6d3a 5428 302c 3537 293d 7338
2705400 3078 5f67 636f 756e 745f 5f37 6973 7472 6561 6d3a 2830 2c31 292c 302c 3332 3b5f 5f76 7074 725f 5f37 6973 7472 6561 6d3a
2705460 2830 2c35 3329 2c33 322c 3332 3b50 696f 733a 2830 2c35 3529 2c36 342c 3332 3b4f 6f73 7472 6561 6d3a 2830 2c34 3929 2c39
2705540 362c 3534 343b 3b00 696f 7374 7265 616d 3a5a 6369 6f73 7472 6561 6d3b 6973 7472 6561 6d20 6f73 7472 6561 6d20 696f 733b
2705620 5f5f 6374 5f5f 3969 6f73 7472 6561 6d46 5039 7374 7265 616d 6275 6620 5f5f 6374 5f5f 3869 6f73 7472 6561 6d46 7620 5f5f
2705700 6374 5f5f 3869 6f73 7472 6561 6d46 5238 696f 7374 7265 616d 205f 5f64 745f 5f38 696f 7374 7265 616d 4676 203b 3b3b 0063
2705760 696e 3a47 2830 2c35 3829 3d78 7369 7374 7265 616d 5f77 6974 6861 7373 6967 6e3a 0063 6f75 743a 4728 302c 3539 293d 7873
2706040 6f73 7472 6561 6d5f 7769 7468 6173 7369 676e 3a00 6365 7272 3a47 2830 2c35 3929 0063 6c6f 673a 4728 302c 3539 2900 496f
2706120 7374 7265 616d 5f69 6e69 743a 5428 302c 3630 293d 7331 5f5f 5731 315f 5f31 3349 6f73 7472 6561 6d5f 696e 6974 3a28 302c
2706200 3229 2c30 2c38 3b3b 0073 7464 7374 6174 7573 5f5f 3133 496f 7374 7265 616d 5f69 6e69 743a 4728 302c 3129 0069 6e69 7463
2706260 6f75 6e74 5f5f 3133 496f 7374 7265 616d 5f69 6e69 743a 4728 302c 3129 0049 6f73 7472 6561 6d5f 696e 6974 3a5a 6349 6f73
2706340 7472 6561 6d5f 696e 6974 3b3b 5f5f 6374 5f5f 3133 496f 7374 7265 616d 5f69 6e69 7446 7620 5f5f 6474 5f5f 3133 496f 7374
2706420 7265 616d 5f69 6e69 7446 7620 3b73 7464 7374 6174 7573 5f5f 3133 496f 7374 7265 616d 5f69 6e69 7420 696e 6974 636f 756e
2706500 745f 5f31 3349 6f73 7472 6561 6d5f 696e 6974 203b 4069 6f73 3b00 696f 7374 7265 616d 5f69 6e69 743a 5328 302c 3630 2900
2706560 4750 543a 7428 302c 3133 2900 736d 616e 6970 5f69 6e74 3a54 2830 2c36 3129 3d73 3866 6374 5f5f 3130 736d 616e 6970 5f69
2706640 6e74 3a28 302c 3632 293d 2a28 302c 3633 293d 6628 302c 3535 292c 302c 3332 3b61 7267 5f5f 3130 736d 616e 6970 5f69 6e74
2706720 3a28 302c 3129 2c33 322c 3332 3b3b 0073 6d61 6e69 705f 696e 743a 5a63 736d 616e 6970 5f69 6e74 3b3b 5f5f 6374 5f5f 3130
2707000 736d 616e 6970 5f69 6e74 4650 4652 3369 6f73 695f 5233 696f 7369 203b 3b5f 5f6c 735f 5f46 5237 6f73 7472 6561 6d52 3130
2707060 736d 616e 6970 5f69 6e74 205f 5f72 735f 5f46 5237 6973 7472 6561 6d52 3130 736d 616e 6970 5f69 6e74 203b 0073 6170 706c
2707140 795f 696e 743a 5428 302c 3634 293d 7334 6663 745f 5f31 3073 6170 706c 795f 696e 743a 2830 2c36 3229 2c30 2c33 323b 3b00
2707220 7361 7070 6c79 5f69 6e74 3a5a 6373 6170 706c 795f 696e 743b 3b5f 5f63 745f 5f31 3073 6170 706c 795f 696e 7446 5046 5233
2707300 696f 7369 5f52 3369 6f73 205f 5f63 6c5f 5f31 3073 6170 706c 795f 696e 7446 6920 3b3b 3b00 696d 616e 6970 5f69 6e74 3a54
2707360 2830 2c36 3529 3d73 3866 6374 5f5f 3130 696d 616e 6970 5f69 6e74 3a28 302c 3636 293d 2a28 302c 3637 293d 6628 302c 3638
2707440 293d 2a28 302c 3534 292c 302c 3332 3b61 7267 5f5f 3130 696d 616e 6970 5f69 6e74 3a28 302c 3129 2c33 322c 3332 3b3b 0069
2707520 6d61 6e69 705f 696e 743a 5a63 696d 616e 6970 5f69 6e74 3b3b 5f5f 6374 5f5f 3130 696d 616e 6970 5f69 6e74 4650 4652 3769
```

```
2707600 7374 7265 616d 695f 5237 6973 7472 6561 6d69 203b 3b5f 5f72 735f 5f46 5237 6973 7472 6561 6d52 3130 696d 616e 6970 5f69
2707660 6e74 203b 0069 6170 706c 795f 696e 743a 5428 302c 3639 293d 7334 6663 745f 5f31 3069 6170 706c 795f 696e 743a 2830 2c36
2707740 3629 2c30 2c33 323b 3b00 6961 7070 6c79 5f69 6e74 3a5a 6369 6170 706c 795f 696e 743b 3b5f 5f63 745f 5f31 3069 6170 706c
2710020 795f 696e 7446 5046 5237 6973 7472 6561 6d69 5f52 3769 7374 7265 616d 205f 5f63 6c5f 5f31 3069 6170 706c 795f 696e 7446
2710100 6920 3b3b 3b00 6f6d 616e 6970 5f69 6e74 3a54 2830 2c37 3029 3d73 3866 6374 5f5f 3130 6f6d 616e 6970 5f69 6e74 3a28 302c
2710160 3731 293d 2a28 302c 3732 293d 6628 302c 3536 292c 302c 3332 3b61 7267 5f5f 3130 6f6d 616e 6970 5f69 6e74 3a28 302c 3129
2710240 2c33 322c 3332 3b3b 006f 6d61 6e69 705f 696e 743a 5a63 6f6d 616e 6970 5f69 6e74 3b3b 5f5f 6374 5f5f 3130 6f6d 616e 6970
2710320 5f69 6e74 4650 4652 376f 7374 7265 616d 695f 5237 6f73 7472 6561 6d69 203b 3b5f 5f6c 735f 5f46 5237 6f73 7472 6561 6d52
2710400 3130 6f6d 616e 6970 5f69 6e74 203b 006f 6170 706c 795f 696e 743a 5428 302c 3733 293d 7334 6663 745f 5f31 306f 6170 706c
2710460 795f 696e 743a 2830 2c37 3129 2c30 2c33 323b 3b00 6f61 7070 6c79 5f69 6e74 3a5a 636f 6170 706c 795f 696e 743b 3b5f 5f63
2710540 745f 5f31 306f 6170 706c 795f 696e 7446 5046 5237 6f73 7472 6561 6d69 5f52 376f 7374 7265 616d 205f 5f63 6c5f 5f31 306f
2710620 6170 706c 795f 696e 7446 6920 3b3b 3b00 696f 6d61 6e69 705f 696e 743a 5428 302c 3734 293d 7338 6663 745f 5f31 3169 6f6d
2710700 616e 6970 5f69 6e74 3a28 302c 3735 293d 2a28 302c 3736 293d 6628 302c 3737 293d 2a28 302c 3537 292c 302c 3332 3b61 7267
2710760 5f5f 3131 696f 6d61 6e69 705f 696e 743a 2830 2c31 292c 3332 2c33 323b 3b00 696f 6d61 6e69 705f 696e 743a 5a63 696f 6d61
2711040 6e69 705f 696e 743b 3b5f 5f63 745f 5f31 3169 6f6d 616e 6970 5f69 6e74 4650 4652 3869 6f73 7472 6561 6d69 5f52 3869 6f73
2711120 7472 6561 6d69 203b 3b5f 5f6c 735f 5f46 5238 696f 7374 7265 616d 5231 3169 6f6d 616e 6970 5f69 6e74 205f 5f72 735f 5f46
2711200 5238 696f 7374 7265 616d 5231 3169 6f6d 616e 6970 5f69 6e74 203b 0069 6f61 7070 6c79 5f69 6e74 3a54 2830 2c37 3829 3d73
2711260 3466 6374 5f5f 3131 696f 6170 706c 795f 696e 743a 2830 2c37 3529 2c30 2c33 323b 3b00 696f 6170 706c 795f 696e 743a 5a63
2711340 696f 6170 706c 795f 696e 743b 3b5f 5f63 745f 5f31 3169 6f61 7070 6c79 5f69 6e74 4650 4652 3869 6f73 7472 6561 6d69 5f52
2711420 3869 6f73 7472 6561 6d20 5f5f 636c 5f5f 3131 696f 6170 706c 795f 696e 7446 6920 3b3b 3b00 736d 616e 6970 5f6c 6f6e 673a
2711500 5428 302c 3739 293d 7338 6663 745f 5f31 3173 6d61 6e69 705f 6c6f 6e67 3a28 302c 3632 292c 302c 3332 3b61 7267 5f5f 3131
2711560 736d 616e 6970 5f6c 6f6e 673a 2830 2c31 292c 3332 2c33 323b 3b00 736d 616e 6970 5f6c 6f6e 673a 5a63 736d 616e 6970 5f6c
2711640 6f6e 673b 3b5f 5f63 745f 5f31 3173 6d61 6e69 705f 6c6f 6e67 4650 4652 3369 6f73 6c5f 5233 696f 736c 203b 3b5f 5f6c 735f
2711720 5f46 5237 6f73 7472 6561 6d52 3131 736d 616e 6970 5f6c 6f6e 6720 5f5f 7273 5f5f 4652 3769 7374 7265 616d 5231 3173 6d61
2712000 6e69 705f 6c6f 6e67 203b 0073 6170 706c 795f 6c6f 6e67 3a54 2830 2c38 3029 3d73 3466 6374 5f5f 3131 7361 7070 6c79 5f6c
2712060 6f6e 673a 2830 2c36 3229 2c30 2c33 323b 3b00 7361 7070 6c79 5f6c 6f6e 673a 5a63 7361 7070 6c79 5f6c 6f6e 673b 3b5f 5f63
2712140 745f 5f31 3173 6170 706c 795f 6c6f 6e67 4650 4652 3369 6f73 6c5f 5233 696f 7320 5f5f 636c 5f5f 3131 7361 7070 6c79 5f6c
2712220 6f6e 6746 6c20 3b3b 3b00 696d 616e 6970 5f6c 6f6e 673a 5428 302c 3831 293d 7338 6663 745f 5f31 3169 6d61 6e69 705f 6c6f
2712300 6e67 3a28 302c 3636 292c 302c 3332 3b61 7267 5f5f 3131 696d 616e 6970 5f6c 6f6e 673a 2830 2c31 292c 3332 2c33 323b 3b00
2712360 696d 616e 6970 5f6c 6f6e 673a 5a63 696d 616e 6970 5f6c 6f6e 673b 3b5f 5f63 745f 5f31 3169 6d61 6e69 705f 6c6f 6e67 4650
2712440 4652 3769 7374 7265 616d 6c5f 5237 6973 7472 6561 6d6c 203b 3b5f 5f72 735f 5f46 5237 6973 7472 6561 6d52 3131 696d 616e
2712520 6970 5f6c 6f6e 6720 3b00 6961 7070 6c79 5f6c 6f6e 673a 5428 302c 3832 293d 7334 6663 745f 5f31 3169 6170 706c 795f 6c6f
2712600 6e67 3a28 302c 3636 292c 302c 3332 3b3b 0069 6170 706c 795f 6c6f 6e67 3a5a 6369 6170 706c 795f 6c6f 6e67 3b3b 5f5f 6374
2712660 5f5f 3131 6961 7070 6c79 5f6c 6f6e 6746 5046 5237 6973 7472 6561 6d6c 5f52 3769 7374 7265 616d 205f 5f63 6c5f 5f31 3169
2712740 6170 706c 795f 6c6f 6e67 466c 203b 3b3b 006f 6d61 6e69 705f 6c6f 6e67 3a54 2830 2c38 3329 3d73 3866 6374 5f5f 3131 6f6d
2713020 616e 6970 5f6c 6f6e 673a 2830 2c37 3129 2c30 2c33 323b 6172 675f 5f31 316f 6d61 6e69 705f 6c6f 6e67 3a28 302c 3129 2c33
2713100 322c 3332 3b3b 006f 6d61 6e69 705f 6c6f 6e67 3a5a 636f 6d61 6e69 705f 6c6f 6e67 3b3b 5f5f 6374 5f5f 3131 6f6d 616e 6970
2713160 5f6c 6f6e 6746 5046 5237 6f73 7472 6561 6d6c 5f52 376f 7374 7265 616d 6c20 3b3b 5f5f 6c73 5f5f 4652 376f 7374 7265 616d
2713240 5231 316f 6d61 6e69 705f 6c6f 6e67 203b 006f 6170 706c 795f 6c6f 6e67 3a54 2830 2c38 3429 3d73 3466 6374 5f5f 3131 6f61
2713320 7070 6c79 5f6c 6f6e 673a 2830 2c37 3129 2c30 2c33 323b 3b00 6f61 7070 6c79 5f6c 6f6e 673a 5a63 6f61 7070 6c79 5f6c 6f6e
2713400 673b 3b5f 5f63 745f 5f31 316f 6170 706c 795f 6c6f 6e67 4650 4652 376f 7374 7265 616d 6c5f 5237 6f73 7472 6561 6d20 5f5f
2713460 636c 5f5f 3131 6f61 7070 6c79 5f6c 6f6e 6746 6c20 3b3b 3b00 696f 6d61 6e69 705f 6c6f 6e67 3a54 2830 2c38 3529 3d73 3866
2713540 6374 5f5f 3132 696f 6d61 6e69 705f 6c6f 6e67 3a28 302c 3735 292c 302c 3332 3b61 7267 5f5f 3132 696f 6d61 6e69 705f 6c6f
2713620 6e67 3a28 302c 3129 2c33 322c 3332 3b3b 0069 6f6d 616e 6970 5f6c 6f6e 673a 5a63 696f 6d61 6e69 705f 6c6f 6e67 3b3b 5f5f
2713700 6374 5f5f 3132 696f 6d61 6e69 705f 6c6f 6e67 4650 4652 3869 6f73 7472 6561 6d6c 5f52 3869 6f73 7472 6561 6d6c 203b 3b5f
2713760 5f6c 735f 5f46 5238 696f 7374 7265 616d 5231 3269 6f6d 616e 6970 5f6c 6f6e 6720 5f5f 7273 5f5f 4652 3869 6f73 7472 6561
2714040 6d52 3132 696f 6161 6e69 705f 6c6f 6e67 203b 0069 6f61 7070 6c79 5f6c 6f6e 673a 5428 302c 3836 293d 7334 6663 745f 5f31
2714120 3269 6f61 7070 6c79 5f6c 6f6e 673a 2830 2c37 3529 2c30 2c33 323b 3b00 696f 6170 706c 795f 6c6f 6e67 3a5a 6369 6f61 7070
2714200 6c79 5f6c 6f6e 673b 3b5f 5f63 745f 5f31 3269 6f61 7070 6c79 5f6c 6f6e 6746 5046 5238 696f 7374 7265 616d 6c5f 5238 696f
2714260 7374 7265 616d 205f 5f63 6c5f 5f31 3269 6f61 7070 6c79 5f6c 6f6e 6746 6c20 3b3b 3b00 7374 6469 6f62 7566 3a54 2830 2c38
2714340 3729 3d73 3532 616c 6c6f 635f 5f39 7374 7265 616d 6275 663a 2830 2c34 292c 302c 3136 3b78 5f75 6e62 7566 5f5f 3973 7472
2714420 6561 6d62 7566 3a28 302c 3429 2c31 362c 3136 3b78 5f62 6173 655f 5f39 7374 7265 616d 6275 663a 2830 2c33 3329 2c33 322c
2714500 3332 3b78 5f70 6261 7365 5f5f 3973 7472 6561 6d62 7566 3a28 302c 3333 292c 3634 2c33 323b 785f 7070 7472 5f5f 3973 7472
2714560 6561 6d62 7566 3a28 302c 3333 292c 3936 2c33 323b 785f 6570 7074 725f 5f39 7374 7265 616d 6275 663a 2830 2c33 3329 2c31
2714640 3238 2c33 323b 785f 6770 7472 5f5f 3973 7472 6561 6d62 7566 3a28 302c 3333 292c 3136 302c 3332 3b78 5f65 6770 7472 5f5f
```

```
2714720 3973 7472 6561 6d62 7566 3a28 302c 3333 292c 3139 322c 3332 3b5c 0078 5f65 6261 636b 5f5f 3973 7472 6561 6d62 7566 3a28
2715000 302c 3333 292c 3232 342c 3332 3b78 5f62 6c65 6e5f 5f39 7374 7265 616d 6275 663a 2830 2c31 292c 3235 362c 3332 3b5f 5f76
2715060 7074 725f 5f39 7374 7265 616d 6275 663a 2830 2c35 3329 2c32 3838 2c33 323b 6670 5f5f 3873 7464 696f 6275 663a 2830 2c38
2715140 3829 3d2a 2830 2c31 3829 3d78 735f 696f 6275 663a 2c33 3230 2c33 323b 6c61 7374 5f6f 705f 5f38 7374 6469 6f62 7566 3a28
2715220 302c 3129 2c33 3532 2c33 323b 6275 665f 5f39 7374 6469 6f62 7566 3a28 302c 3839 293d 6172 2830 2c31 293b 303b 313b 2830
2715300 2c32 292c 3338 342c 3136 3b3b 0073 7464 696f 6275 663a 5a63 7374 6469 6f62 7566 3b73 7472 6561 6d62 7566 3b6f 7665 7266
2715360 6c6f 775f 5f38 7374 6469 6f62 7566 4669 2075 6e64 6572 666c 6f77 5f5f 3873 7464 696f 6275 6646 7620 7379 6e63 5f5f 3873
2715440 7464 696f 6275 6646 7620 7365 656b 6f66 665f 5f38 7374 6469 6f62 7566 466c 3873 6565 6b5f 6469 7269 2070 6261 636b 6661
2715520 696c 5f5f 3873 7464 696f 6275 6646 6920 5f5f 6374 5f5f 3873 7464 696f 6275 6646 5036 5f69 6f62 7566 205f 5f63 745f 5f38
2715600 7374 6469 6f62 7566 4652 4338 7374 6469 6f62 7566 205c 0073 7464 696f 6669 6c65 5f5f 3873 7464 696f 6275 6646 7620 5f5f
2715660 6474 5f5f 3873 7464 696f 6275 6646 7620 3b3b 3b00 6669 6c65 6275 663a 5428 302c 3930 293d 7336 3461 6c6c 6f63 5f5f 3973
2715740 7472 6561 6d62 7566 3a28 302c 3429 2c30 2c31 363b 785f 756e 6275 665f 5f39 7374 7265 616d 6275 663a 2830 2c34 292c 3136
2716020 2c31 363b 785f 6261 7365 5f5f 3973 7472 6561 6d62 7566 3a28 302c 3333 292c 3332 2c33 323b 785f 7062 6173 655f 5f39 7374
2716100 7265 616d 6275 663a 2830 2c33 3329 2c36 342c 3332 3b78 5f70 7074 725f 5f39 7374 7265 616d 6275 663a 2830 2c33 3329 2c39
2716160 362c 3332 3b78 5f65 7070 7472 5f5f 3973 7472 6561 6d62 7566 3a28 302c 3333 292c 3132 382c 3332 3b78 5f67 7074 725f 5f39
2716240 7374 7265 616d 6275 663a 2830 2c33 3329 2c31 3630 2c33 323b 785f 6567 7074 725f 5f39 7374 7265 616d 6275 663a 2830 2c33
2716320 3329 2c31 3932 2c33 323b 5c00 785f 6562 6163 6b5f 5f39 7374 7265 616d 6275 663a 2830 2c33 3329 2c32 3234 2c33 323b 785f
2716400 626c 656e 5f5f 3973 7472 6561 6d62 7566 3a28 302c 3129 2c32 3536 2c33 323b 5f5f 7670 7472 5f5f 3973 7472 6561 6d62 7566
2716460 3a28 302c 3533 292c 3238 382c 3332 3b78 6664 5f5f 3766 696c 6562 7566 3a28 302c 3129 2c33 3230 2c33 323b 6d6f 6465 5f5f
2716540 3766 696c 6562 7566 3a28 302c 3129 2c33 3532 2c33 323b 6f70 656e 6564 5f5f 3766 696c 6562 7566 3a28 302c 3229 2c33 3834
2716620 2c38 3b6c 6173 745f 7365 656b 5f5f 3766 696c 6562 7566 3a28 302c 3129 2c34 3136 2c33 323b 696e 5f73 7461 7274 5f5f 3766
2716700 696c 6562 7566 3a28 302c 3333 292c 3434 382c 3332 3b6c 6168 6561 645f 5f37 6669 6c65 6275 663a 2830 2c38 3929 2c34 3830
2716760 2c31 363b 3b00 6f70 656e 7072 6f74 5f5f 3766 696c 6562 7566 3a47 2830 2c31 2900 6669 6c65 6275 663a 5a63 6669 6c65 6275
2717040 663b 7374 7265 616d 6275 663b 5f5f 6374 5f5f 3766 696c 6562 7566 4676 205f 5f63 745f 5f37 6669 6c65 6275 6646 6920 5f5f
2717120 6374 5f5f 3766 696c 6562 7566 4669 5063 5431 205f 5f63 745f 5f37 6669 6c65 6275 6646 5243 3766 696c 6562 7566 2069 735f
2717200 6f70 656e 5f5f 3766 696c 6562 7566 4676 2066 645f 5f37 6669 6c65 6275 6646 7620 6f70 656e 5f5f 3766 696c 6562 7566 4650
2717260 4363 6954 3220 6174 7461 6368 5f5f 3766 696c 6562 7566 4669 2063 6c6f 7365 5f5f 3766 696c 6562 7566 4676 205c 005f 5f64
2717340 745f 5f37 6669 6c65 6275 6646 7620 6f76 5572 666c 6f77 5f5f 3766 696c 6562 7566 4669 2075 6e64 6572 666c 6f77 5f5f 3766
2717420 696c 6562 7566 4676 2073 796e 635f 5f37 6669 6c65 6275 6646 7620 7365 656b 6f66 665f 5f37 6669 6c65 6275 6646 6c38 7365
2717500 656b 5f64 6972 6920 7365 7462 7566 5f5f 3766 696c 6562 7566 4650 6369 206c 6173 745f 6f70 5f5f 3766 696c 6562 7566 4676
2717560 203b 6f70 656e 7072 6f74 5f5f 3766 696c 6562 7566 203b 3b00 6673 7472 6561 6d62 6173 653a 5428 302c 3931 293d 7331 3332
2717640 6275 665f 5f31 3166 7374 7265 616d 6261 7365 3a28 302c 3930 292c 302c 3531 323b 5f5f 7670 7472 5f5f 3131 6673 7472 6561
2717720 6d62 6173 653a 2830 2c35 3329 2c35 3132 2c33 323b 5069 6f73 3a28 302c 3535 292c 3534 342c 3332 3b4f 696f 733a 2830 2c34
2720000 3629 2c35 3736 2c34 3830 3b3b 0066 7374 7265 616d 6261 7365 3a5a 6366 7374 7265 616d 6261 7365 3b69 6f73 3b5f 5f63 745f
2720060 5f31 3166 7374 7265 616d 6261 7365 4676 205f 5f63 745f 5f31 3166 7374 7265 616d 6261 7365 4650 4363 6954 3220 5f5f 6374
2720140 5f5f 3131 6673 7472 6561 6d62 6173 6546 6920 5f5f 6374 5f5f 3131 6673 7472 6561 6d62 6173 6546 6950 6354 3120 5f5f 6374
2720220 5f5f 3131 6673 7472 6561 6d62 6173 6546 5231 3166 7374 7265 616d 6261 7365 205f 5f64 745f 5f31 3166 7374 7265 616d 6261
2720300 7365 4676 206f 7065 6e5f 5f31 3166 7374 7265 616d 6261 7365 4650 4363 6954 3220 5c00 6174 7461 6368 5f5f 3131 6673 7472
2720360 6561 6d62 6173 6546 6920 636c 6f73 655f 5f31 3166 7374 7265 616d 6261 7365 4676 2073 6574 6275 665f 5f31 3166 7374 7265
2720440 616d 6261 7365 4650 6369 2072 6462 7566 5f5f 3131 6673 7472 6561 6d62 6173 6546 7620 7665 7269 6679 5f5f 3131 6673 7472
2720520 6561 6d62 6173 6546 6920 3b3b 3b00 7374 6174 655f 7661 6c75 653a 7428 302c 3431 2900 4f62 6a65 6374 3a54 2830 2c39 3229
2720600 3d73 345f 5f76 7074 725f 5f36 4f62 6a65 6374 3a28 302c 3533 292c 302c 3332 3b3b 004f 626a 6563 743a 5a63 4f62 6a65 6374
2720660 3b3b 5f5f 6374 5f5f 364f 626a 6563 7446 7620 5f5f 6374 5f5f 364f 626a 6563 7446 5243 364f 626a 6563 7420 6572 726f 724d
2720740 656d 6f72 795f 5f36 4f62 6a65 6374 4650 6354 3120 6578 706c 6169 6e5f 5f36 4f62 6a65 6374 4650 6320 696e 4f72 6465 725f
2721020 5f36 4f62 6a65 6374 4650 364f 626a 6563 7420 3b3b 3b00 5f5f 7074 626c 5f5f 364f 626a 6563 745f 5f41 6c6c 426c 6f63 6b73
2721100 5f31 5f63 7878 3a47 2830 2c35 3329 0050 463a 7428 302c 3135 2900 5046 433a 7428 302c 3135 2900 5046 493a 7428 302c 3135
2721160 2900 4e4f 626a 6563 743a 5428 302c 3933 293d 7338 5f5f 7670 7472 5f5f 364f 626a 6563 743a 2830 2c35 3329 2c30 2c33 323b
2721240 6e61 6d65 5f5f 374e 4f62 6a65 6374 3a28 302c 3333 292c 3332 2c33 323b 3b00 4e4f 626a 6563 743a 5a63 4e4f 626a 6563 743b
2721320 4f62 6a65 6374 3b5f 5f63 745f 5f37 4e4f 626a 6563 7446 5063 205f 5f63 745f 5f37 4e4f 626a 6563 7446 5243 374e 4f62 6a65
2721400 6374 2073 6574 4e61 6d65 5f5f 374e 4f62 6a65 6374 4650 6320 6765 744e 616d 655f 5f37 4e4f 626a 6563 7446 7620 6578 706c
2721460 6169 6e5f 5f37 4e4f 626a 6563 7446 5063 2067 6574 4174 7472 5f5f 374e 4f62 6a65 6374 4669 2067 6574 5072 6f70 5f5f 374e
2721540 4f62 6a65 6374 4650 6369 2073 6574 5072 6f70 5f5f 374e 4f62 6a65 6374 4650 6354 3120 5c00 7365 7450 726f 705f 5f37 4e4f
2721620 626a 6563 7446 5063 6920 7365 7450 726f 705f 5f37 4e4f 626a 6563 7446 5063 6620 6973 4754 455f 5f37 4e4f 626a 6563 7446
2721700 5036 4f62 6a65 6374 2069 734c 5445 5f5f 374e 4f62 6a65 6374 4650 364f 626a 6563 7420 3b3b 3b00 6f73 7472 6561 6d5f 7769
2721760 7468 6173 7369 676e 3a54 2830 2c35 3929 3d73 3638 5f5f 7670 7472 5f5f 376f 7374 7265 616d 3a28 302c 3533 292c 302c 3332
```

| | | | | | | | | | | | | | | | | | | | | | | | | |
|---|---|---|---|---|---|---|---|---|---|---|---|---|---|---|---|---|---|---|---|---|---|---|---|---|
| 2722040 | 3b50 | 696f | 733a | 2830 | 2c35 | 3529 | 2c33 | 322c | 3332 | 3b4f | 696f | 733a | 2830 | 2c34 | 3629 | 2c36 | 342c | 3438 | 303b | 3b00 | 6f73 | 7472 | 6561 | 6d5f |
| 2722120 | 7769 | 7468 | 6173 | 7369 | 676e | 3a5a | 636f | 7374 | 7265 | 616d | 5f77 | 6974 | 6861 | 7373 | 6967 | 6e3b | 6f73 | 7472 | 6561 | 6d20 | 696f | 733b | 5f5f | 6374 |
| 2722200 | 5f5f | 3138 | 6f73 | 7472 | 6561 | 6d5f | 7769 | 7468 | 6173 | 7369 | 676e | 4676 | 205f | 5f63 | 745f | 5f31 | 386f | 7374 | 7265 | 616d | 5f77 | 6974 | 6861 | 7373 |
| 2722260 | 6967 | 6e46 | 5231 | 396f | 7374 | 7265 | 616d | 5f77 | 6974 | 6861 | 7373 | 6967 | 6e20 | 5f5f | 6474 | 5f5f | 3138 | 6f73 | 7472 | 6561 | 6d5f | 7769 | 7468 | 6173 |
| 2722340 | 7369 | 676e | 4676 | 205f | 5f61 | 735f | 5f31 | 386f | 7374 | 7265 | 616d | 5f77 | 6974 | 6861 | 7373 | 6967 | 6e46 | 5237 | 6f73 | 7472 | 6561 | 6d20 | 5c00 | 5f5f |
| 2722420 | 6173 | 5f5f | 3138 | 6f73 | 7472 | 6561 | 6d5f | 7769 | 7468 | 6173 | 7369 | 676e | 4650 | 3973 | 7472 | 6561 | 6d62 | 7566 | 203b | 3b3b | 0050 | 4642 | 3a74 | 2830 |
| 2722500 | 2c31 | 3529 | 004c | 4e4f | 626a | 6563 | 743a | 5428 | 302c | 3934 | 293d | 7331 | 325f | 5f76 | 7074 | 725f | 5f36 | 4f62 | 6a65 | 6374 | 3a28 | 302c | 3533 | 292c |
| 2722560 | 302c | 3332 | 3b6e | 616d | 655f | 5f37 | 4e4f | 626a | 6563 | 743a | 2830 | 2c33 | 3329 | 2c33 | 322c | 3332 | 3b6e | 6578 | 745f | 5f38 | 4c4e | 4f62 | 6a65 | 6374 |
| 2722640 | 3a28 | 302c | 3935 | 293d | 2a28 | 302c | 3934 | 292c | 3634 | 2c33 | 323b | 3b00 | 4c4e | 4f62 | 6a65 | 6374 | 3a5a | 634c | 4e4f | 626a | 6563 | 743b | 4e4f | 626a |
| 2722720 | 6563 | 743b | 5f5f | 6374 | 5f5f | 384c | 4e4f | 626a | 6563 | 7446 | 5063 | 5038 | 4c4e | 4f62 | 6a65 | 6374 | 205f | 5f63 | 745f | 5f38 | 4c4e | 4f62 | 6a65 | 6374 |
| 2723000 | 4652 | 4338 | 4c4e | 4f62 | 6a65 | 6374 | 2073 | 6574 | 4e65 | 7874 | 5f5f | 384c | 4e4f | 626a | 6563 | 7446 | 5038 | 4c4e | 4f62 | 6a65 | 6374 | 2067 | 6574 | 4e65 |
| 2723060 | 7874 | 5f5f | 384c | 4e4f | 626a | 6563 | 7446 | 7620 | 3b3b | 3b00 | 4c4f | 626a | 6563 | 743a | 5428 | 302c | 3936 | 293d | 7338 | 5f5f | 7670 | 7472 | 5f5f | 364f |
| 2723140 | 626a | 6563 | 743a | 2830 | 2c35 | 3329 | 2c30 | 2c33 | 323b | 6e65 | 7874 | 5f5f | 374c | 4f62 | 6a65 | 6374 | 3a28 | 302c | 3937 | 293d | 2a28 | 302c | 3936 | 292c |
| 2723220 | 3332 | 2c33 | 323b | 3b00 | 4c4f | 626a | 6563 | 743a | 5a63 | 4c4f | 626a | 6563 | 743b | 4f62 | 6a65 | 6374 | 3b5f | 5f63 | 745f | 5f37 | 4c4f | 626a | 6563 | 7446 |
| 2723300 | 5037 | 4c4f | 626a | 6563 | 7420 | 5f5f | 6374 | 5f5f | 374c | 4f62 | 6a65 | 6374 | 4652 | 4337 | 4c4f | 626a | 6563 | 7420 | 7365 | 744e | 6578 | 745f | 5f37 | 4c4f |
| 2723360 | 626a | 6563 | 7446 | 5037 | 4c4f | 626a | 6563 | 7420 | 6765 | 744e | 6578 | 745f | 5f37 | 4c4f | 626a | 6563 | 7446 | 7620 | 3b3b | 3b00 | 4c50 | 4f62 | 6a65 | 6374 |
| 2723440 | 3a54 | 2830 | 2c39 | 3929 | 3d73 | 3132 | 5f5f | 7670 | 7472 | 5f5f | 364f | 626a | 6563 | 743a | 2830 | 2c35 | 3329 | 2c30 | 2c33 | 323b | 6e65 | 7874 | 5f5f | 374c |
| 2723520 | 4f62 | 6a65 | 6374 | 3a28 | 302c | 3937 | 292c | 3332 | 2c33 | 323b | 6e6f | 626a | 7074 | 725f | 5f38 | 4c50 | 4f62 | 6a65 | 6374 | 3a28 | 302c | 3939 | 293d | 2a28 |
| 2723600 | 302c | 3933 | 292c | 3634 | 2c33 | 323b | 3b00 | 4c50 | 4f62 | 6a65 | 6374 | 3a5a | 634c | 504f | 626a | 6563 | 743b | 4c4f | 626a | 6563 | 743b | 5f5f | 6374 | 5f5f |
| 2723660 | 384c | 504f | 626a | 6563 | 7446 | 5037 | 4e4f | 626a | 6563 | 7450 | 374c | 4f62 | 6a65 | 6374 | 205f | 5f63 | 745f | 5f38 | 4c50 | 4f62 | 6a65 | 6374 | 4652 | 4338 |
| 2723740 | 4c50 | 4f62 | 6a65 | 6374 | 2073 | 6574 | 4f62 | 6a65 | 6374 | 5f5f | 384c | 504f | 626a | 6563 | 7446 | 5037 | 4e4f | 626a | 6563 | 7420 | 6765 | 744f | 626a | 6563 |
| 2724020 | 745f | 5f38 | 4c50 | 4f62 | 6a65 | 6374 | 4676 | 2065 | 7870 | 6c61 | 696e | 5f5f | 384c | 504f | 626a | 6563 | 7446 | 5063 | 203b | 3b3b | 005f | 5f70 | 7462 | 6c5f |
| 2724100 | 5f38 | 4c50 | 4f62 | 6a65 | 6374 | 5f5f | 416c | 6c42 | 6c6f | 636b | 735f | 315f | 6378 | 783a | 4728 | 302c | 3533 | 2900 | 4c69 | 7374 | 3a54 | 2830 | 2c31 | 3030 |
| 2724160 | 293d | 7331 | 3263 | 6f75 | 6e74 | 5f5f | 344c | 6973 | 743a | 2830 | 2c31 | 292c | 302c | 3332 | 3b70 | 7472 | 4c4f | 626a | 6563 | 745f | 5f34 | 4c69 | 7374 | 3a28 |
| 2724240 | 302c | 3937 | 292c | 3332 | 2c33 | 323b | 5f5f | 7670 | 7472 | 5f5f | 344c | 6973 | 743a | 2830 | 2c35 | 3329 | 2c36 | 342c | 3332 | 3b3b | 004c | 6973 | 743a | 5a63 |
| 2724320 | 4c69 | 7374 | 3b3b | 5f5f | 6374 | 5f5f | 344c | 6973 | 7446 | 7620 | 5f5f | 6374 | 5f5f | 344c | 6973 | 7446 | 5243 | 344c | 6973 | 7420 | 5f5f | 6474 | 5f5f | 344c |
| 2724400 | 6973 | 7446 | 7620 | 6765 | 7443 | 6f75 | 6e74 | 5f5f | 344c | 6973 | 7446 | 7620 | 6765 | 7454 | 6f70 | 5f5f | 344c | 6973 | 7446 | 7620 | 7365 | 7454 | 6f70 | 5f5f |
| 2724460 | 344c | 6973 | 7446 | 5037 | 4c4f | 626a | 6563 | 7420 | 6572 | 726f | 724d | 656d | 6f72 | 795f | 5f34 | 4c69 | 7374 | 4650 | 6354 | 3120 | 6272 | 6f61 | 6463 | 6173 |
| 2724540 | 745f | 5f34 | 4c69 | 7374 | 464d | 364f | 626a | 6563 | 7446 | 765f | 7620 | 6578 | 706c | 6169 | 6e5f | 5f34 | 4c69 | 7374 | 4650 | 6320 | 5c00 | 696e | 7365 | 7274 |
| 2724620 | 5f5f | 344c | 6973 | 7446 | 5037 | 4c4f | 626a | 6563 | 7420 | 6973 | 4d65 | 6d62 | 6572 | 5f5f | 344c | 6973 | 7446 | 5037 | 4c4f | 626a | 6563 | 7420 | 6973 | 4d65 |
| 2724700 | 6d62 | 6572 | 5f5f | 344c | 6973 | 7446 | 5063 | 2069 | 7345 | 7175 | 616c | 5f5f | 344c | 6973 | 7446 | 5234 | 4c69 | 7374 | 2072 | 656d | 6f76 | 655f | 5f34 | 4c69 |
| 2724760 | 7374 | 4650 | 6320 | 3b3b | 3b00 | 5f5f | 7074 | 626c | 5f5f | 344c | 6973 | 745f | 5f41 | 6c6c | 426c | 6f63 | 6b73 | 5f31 | 5f63 | 7878 | 3a47 | 2830 | 2c35 | 3329 |
| 2725040 | 0050 | 4c69 | 7374 | 3a54 | 2830 | 2c31 | 3031 | 293d | 7331 | 3263 | 6f75 | 6e74 | 5f5f | 344c | 6973 | 743a | 2830 | 2c31 | 292c | 302c | 3332 | 3b70 | 7472 | 4c4f |
| 2725120 | 626a | 6563 | 745f | 5f34 | 4c69 | 7374 | 3a28 | 302c | 3937 | 292c | 3332 | 2c33 | 323b | 5f5f | 7670 | 7472 | 5f5f | 344c | 6973 | 743a | 2830 | 2c35 | 3329 | 2c36 |
| 2725200 | 342c | 3332 | 3b3b | 0050 | 4c69 | 7374 | 3a5a | 6350 | 4c69 | 7374 | 3b4c | 6973 | 743b | 696e | 7365 | 7274 | 5f5f | 3550 | 4c69 | 7374 | 4650 | 384c | 504f | 626a |
| 2725260 | 6563 | 7420 | 696e | 7365 | 7274 | 5f5f | 3550 | 4c69 | 7374 | 4652 | 3550 | 4c69 | 7374 | 2053 | 6f72 | 745f | 504c | 6973 | 745f | 5f35 | 504c | 6973 | 7446 | 6920 |
| 2725340 | 7265 | 7665 | 7273 | 655f | 5f35 | 504c | 6973 | 7446 | 7620 | 696e | 7365 | 7274 | 4166 | 7465 | 725f | 5f35 | 504c | 6973 | 7446 | 5038 | 4c50 | 4f62 | 6a65 | 6374 |
| 2725420 | 5431 | 2072 | 656d | 6f76 | 655f | 5f35 | 504c | 6973 | 7446 | 5038 | 4c50 | 4f62 | 6a65 | 6374 | 2072 | 656d | 6f76 | 655f | 5f35 | 504c | 6973 | 7446 | 5063 | 2069 |
| 2725500 | 734d | 656d | 6265 | 725f | 5f35 | 504c | 6973 | 7446 | 5063 | 205c | 0069 | 734d | 656d | 6265 | 725f | 5f35 | 504c | 6973 | 7446 | 5037 | 4c4f | 626a | 6563 | 7420 |
| 2725560 | 6973 | 4571 | 7561 | 6c5f | 5f35 | 504c | 6973 | 7446 | 5234 | 4c69 | 7374 | 2065 | 7870 | 6c61 | 696e | 5f5f | 3550 | 4c69 | 7374 | 4650 | 6320 | 5f5f | 6374 | 5f5f |
| 2725640 | 3550 | 4c69 | 7374 | 4652 | 4335 | 504c | 6973 | 7420 | 5f5f | 6374 | 5f5f | 3550 | 4c69 | 7374 | 4676 | 203b | 3b3b | 005f | 5f70 | 7462 | 6c5f | 5f35 | 504c | 6973 |
| 2725720 | 745f | 5f41 | 6c6c | 426c | 6f63 | 6b73 | 5f31 | 5f63 | 7878 | 3a47 | 2830 | 2c35 | 3329 | 004c | 6973 | 7449 | 7465 | 7261 | 746f | 723a | 5428 | 302c | 3130 | 3229 |
| 2726000 | 3d73 | 396c | 6973 | 745f | 5f31 | 324c | 6973 | 7449 | 7465 | 7261 | 746f | 723a | 2830 | 2c31 | 3033 | 293d | 2a28 | 302c | 3130 | 3029 | 2c30 | 2c33 | 323b | 705f |
| 2726060 | 5f31 | 324c | 6973 | 7449 | 7465 | 7261 | 746f | 723a | 2830 | 2c39 | 3729 | 2c33 | 322c | 3332 | 3b3b | 004c | 6973 | 7449 | 7465 | 7261 | 746f | 723a | 5a63 | 4c69 |
| 2726140 | 7374 | 4974 | 6572 | 6174 | 6f72 | 3b3b | 5f5f | 6374 | 5f5f | 3132 | 4c69 | 7374 | 4974 | 6572 | 6174 | 6f72 | 4652 | 344c | 6973 | 7420 | 7265 | 7365 | 745f | 5f31 |
| 2726220 | 324c | 6973 | 7449 | 7465 | 7261 | 746f | 7246 | 7620 | 6174 | 7461 | 6368 | 5f5f | 3132 | 4c69 | 7374 | 4974 | 6572 | 6174 | 6f72 | 4652 | 344c | 6973 | 7420 | 6765 |
| 2726300 | 7443 | 7572 | 7265 | 6e74 | 5f5f | 3132 | 4c69 | 7374 | 4974 | 6572 | 6174 | 6f72 | 4676 | 205f | 5f70 | 705f | 5f31 | 324c | 6973 | 7449 | 7465 | 7261 | 746f | 7246 |
| 2726360 | 7620 | 3b3b | 3b00 | 5069 | 6e4c | 656e | 6774 | 683a | 5428 | 302c | 3130 | 3429 | 3d73 | 3136 | 5f5f | 7670 | 7472 | 5f5f | 364f | 626a | 6563 | 743a | 2830 | 2c35 |
| 2726440 | 3329 | 2c30 | 2c33 | 323b | 6e61 | 6d65 | 5f5f | 374e | 4f62 | 6a65 | 6374 | 3a28 | 302c | 3333 | 292c | 3332 | 2c33 | 323b | 436c | 656e | 6774 | 685f | 5f39 | 5069 |
| 2726520 | 6e4c | 656e | 6774 | 693a | 2830 | 2c33 | 3329 | 2c36 | 342c | 3332 | 3b49 | 6c65 | 6e67 | 7468 | 5f5f | 3950 | 696e | 4c65 | 6e67 | 7468 | 3a28 | 302c | 3129 | 2c39 |
| 2726600 | 362c | 3332 | 3b3b | 0050 | 696e | 4c65 | 6e67 | 7468 | 3a5a | 6350 | 696e | 4c65 | 6e67 | 7468 | 3b4e | 4f62 | 6a65 | 6374 | 3b5f | 5f63 | 745f | 5f39 | 5069 | 6e4c |
| 2726660 | 656e | 6774 | 6846 | 5063 | 5431 | 205f | 5f63 | 745f | 5f39 | 5069 | 6e4c | 656e | 6774 | 6846 | 5243 | 3950 | 696e | 4c65 | 6e67 | 7468 | 2073 | 6574 | 5f50 | 696e |
| 2726740 | 4c65 | 6e67 | 7468 | 5f5f | 3950 | 696e | 4c65 | 6e67 | 7468 | 4650 | 6354 | 3120 | 6765 | 745f | 495f | 5069 | 6e4c | 656e | 6774 | 685f | 5f39 | 5069 | 6e4c | 656e |
| 2727020 | 6774 | 6846 | 7620 | 6765 | 745f | 495f | 5069 | 6e4c | 656e | 6774 | 685f | 5f39 | 5069 | 6e4c | 656e | 6774 | 6846 | 6920 | 3b3b | 3b00 | 4d6f | 6447 | 656e | 3a54 |
| 2727100 | 2830 | 2c31 | 3035 | 293d | 7332 | 3442 | 6974 | 5769 | 6474 | 685f | 5f36 | 4d6f | 6447 | 656e | 3a28 | 302c | 3129 | 2c30 | 2c33 | 323b | 4553 | 7461 | 7465 | 5f5f |

| | | | | | | | | | | | | | | | | | | | | | | | | |
|---|---|---|---|---|---|---|---|---|---|---|---|---|---|---|---|---|---|---|---|---|---|---|---|---|
| 2727160 | 364d | 6f64 | 4765 | 6e3a | 2830 | 2c34 | 3029 | 2c33 | 322c | 3332 | 3b50 | 696e | 4e61 | 6d65 | 4c65 | 6e67 | 7468 | 5f5f | 364d | 6f64 | 4765 | 6e3a | 2830 | 2c31 |
| 2727240 | 3031 | 292c | 3634 | 2c39 | 363b | 5f5f | 7670 | 7472 | 5f5f | 364d | 6f64 | 4765 | 6e3a | 2830 | 2c35 | 3329 | 2c31 | 3630 | 2c33 | 323b | 3b00 | 4d6f | 6447 | 656e |
| 2727320 | 3a5a | 634d | 6f64 | 4765 | 6e3b | 3b5f | 5f63 | 745f | 5f36 | 4d6f | 6447 | 656e | 4676 | 205f | 5f63 | 745f | 5f36 | 4d6f | 6447 | 656e | 4652 | 4336 | 4d6f | 6447 |
| 2727400 | 656e | 2073 | 6574 | 5f42 | 6974 | 5769 | 6474 | 685f | 5f36 | 4d6f | 6447 | 656e | 4669 | 2073 | 6574 | 5f45 | 5374 | 6174 | 655f | 5f36 | 4d6f | 6447 | 656e | 4637 |
| 2727460 | 426f | 6f6c | 6561 | 6e20 | 6765 | 745f | 4553 | 7461 | 7465 | 5f5f | 364d | 6f64 | 4765 | 6e46 | 7620 | 7365 | 745f | 5069 | 6e4c | 656e | 6774 | 685f | 5f36 | 4d6f |
| 2727540 | 6447 | 656e | 4650 | 6354 | 3120 | 6765 | 745f | 5069 | 6e4c | 656e | 6774 | 685f | 5f36 | 4d6f | 6447 | 656e | 4650 | 6320 | 7365 | 7449 | 6e64 | 6578 | 5f5f | 364d |
| 2727620 | 6f64 | 4765 | 6e46 | 7620 | 5c00 | 7365 | 744e | 616d | 6549 | 6e64 | 6578 | 5f5f | 364d | 6f64 | 4765 | 6e46 | 5063 | 204c | 6f61 | 645f | 5648 | 444c | 5f44 | 6174 |
| 2727700 | 615f | 5f36 | 4d6f | 6447 | 656e | 4650 | 374e | 4f62 | 6a65 | 6374 | 2043 | 6f6d | 706f | 7365 | 5f4d | 6f64 | 4765 | 6e5f | 4465 | 7363 | 7269 | 7074 | 6f72 | 5f5f |
| 2727760 | 364d | 6f64 | 4765 | 6e46 | 5063 | 2065 | 7870 | 6c61 | 696e | 5f5f | 364d | 6f64 | 4765 | 6e46 | 7620 | 5f5f | 6474 | 5f5f | 364d | 6f64 | 4765 | 6e46 | 7620 | 3b3b |
| 2730040 | 3b00 | 5f5f | 7074 | 626c | 5f5f | 364d | 6f64 | 4765 | 6e5f | 5f41 | 6c6c | 426c | 6f63 | 6b73 | 5f31 | 5f63 | 7878 | 3a47 | 2830 | 2c35 | 3329 | 0049 | 4f5f | 4d61 |
| 2730120 | 6e61 | 6765 | 723a | 5428 | 302c | 3130 | 3629 | 3d73 | 3336 | 6966 | 705f | 5f31 | 3049 | 4f5f | 4d61 | 6e61 | 6765 | 723a | 2830 | 2c38 | 3829 | 2c30 | 2c33 | 323b |
| 2730200 | 6f66 | 705f | 5f31 | 3049 | 4f5f | 4d61 | 6e61 | 6765 | 723a | 2830 | 2c38 | 3829 | 2c33 | 322c | 3332 | 3b6d | 6670 | 5f5f | 3130 | 494f | 5f4d | 616e | 6167 | 6572 |
| 2730260 | 3a28 | 302c | 3838 | 292c | 3634 | 2c33 | 323b | 6366 | 705f | 5f31 | 3049 | 4f5f | 4d61 | 6e61 | 6765 | 723a | 2830 | 2c38 | 3829 | 2c39 | 362c | 3332 | 3b49 | 4669 |
| 2730340 | 6c65 | 4e61 | 6d65 | 5f5f | 3130 | 494f | 5f4d | 616e | 6167 | 6572 | 3a28 | 302c | 3333 | 292c | 3132 | 382c | 3332 | 3b4f | 4669 | 6c65 | 4e61 | 6d65 | 5f5f | 3130 |
| 2730420 | 494f | 5f4d | 616e | 6167 | 6572 | 3a28 | 302c | 3333 | 292c | 3136 | 302c | 3332 | 3b4d | 4669 | 6c65 | 4e61 | 6d65 | 5f5f | 3130 | 494f | 5f4d | 616e | 6167 | 6572 |
| 2730500 | 3a28 | 302c | 3333 | 292c | 3139 | 322c | 3332 | 3b43 | 4669 | 6c65 | 4e61 | 6d65 | 5f5f | 3130 | 494f | 5f4d | 616e | 6167 | 6572 | 3a28 | 302c | 3333 | 292c | 3232 |
| 2730560 | 342c | 3332 | 3b63 | 754c | 696e | 655f | 5f31 | 3049 | 4f5f | 4d61 | 6e61 | 6765 | 723a | 2830 | 2c31 | 292c | 3235 | 362c | 3332 | 3b3b | 0049 | 4f5f | 4d61 | 6e61 |
| 2730640 | 6765 | 723a | 5a63 | 494f | 5f4d | 616e | 6167 | 6572 | 3b3b | 5f5f | 6374 | 5f5f | 3130 | 494f | 5f4d | 616e | 6167 | 6572 | 4650 | 6320 | 5f5f | 6474 | 5f5f | 3130 |
| 2730720 | 494f | 5f4d | 616e | 6167 | 6572 | 4676 | 2049 | 4f43 | 6865 | 636b | 5f5f | 3130 | 494f | 5f4d | 616e | 6167 | 6572 | 4676 | 2043 | 6f70 | 7946 | 696c | 6554 | 6f4c |
| 2731000 | 696e | 655f | 5f31 | 3049 | 4f5f | 4d61 | 6e61 | 6765 | 7246 | 6920 | 436f | 7079 | 4669 | 6c65 | 546f | 456e | 645f | 5f31 | 3049 | 4f5f | 4d61 | 6e61 | 6765 | 7246 |
| 2731060 | 7620 | 5374 | 6174 | 6d65 | 6e74 | 4861 | 6e64 | 656c | 6572 | 5f5f | 3130 | 494f | 5f4d | 616e | 6167 | 6572 | 4650 | 6354 | 3169 | 205c | 0043 | 6f70 | 7946 | 696c |
| 2731140 | 6554 | 6f4b | 6579 | 575f | 5f31 | 3049 | 4f5f | 4d61 | 6e61 | 6765 | 7246 | 5063 | 5431 | 2045 | 6174 | 5f53 | 7461 | 7465 | 6d65 | 6e74 | 5f5f | 3130 | 494f | 5f4d |
| 2731220 | 616e | 6167 | 6572 | 4650 | 6354 | 3120 | 575f | 4f75 | 7446 | 696c | 655f | 5f31 | 3049 | 4f5f | 4d61 | 6e61 | 6765 | 7246 | 5063 | 2057 | 5f4d | 4669 | 6c65 | 5f5f |
| 2731300 | 3130 | 494f | 5f4d | 616e | 6167 | 6572 | 4650 | 6320 | 575f | 4346 | 696c | 655f | 5f31 | 3049 | 4f5f | 4d61 | 6e61 | 6765 | 7246 | 5063 | 203b | 3b3b | 005f | 5f43 |
| 2731360 | 3537 | 3a54 | 2830 | 2c31 | 3037 | 2931 | 7534 | 7376 | 616c | 7565 | 3a28 | 302c | 3333 | 292c | 302c | 3332 | 3b69 | 7661 | 6c75 | 653a | 2830 | 2c31 | 292c | 302c |
| 2731440 | 3332 | 3566 | 7661 | 6c75 | 653a | 2830 | 2c39 | 292c | 302c | 3332 | 3b3b | 005f | 5f43 | 3537 | 3a5a | 635f | 5f43 | 3537 | 3b3b | 3b3b | 3b00 | 4765 | 6e56 | 616c |
| 2731520 | 7565 | 3a54 | 2830 | 2c31 | 3038 | 293d | 7331 | 365f | 5f76 | 7074 | 725f | 5f36 | 4f62 | 6a65 | 6374 | 3a28 | 302c | 3533 | 292c | 302c | 3332 | 3b6e | 616d | 655f |
| 2731600 | 5f37 | 4e4f | 626a | 6563 | 743a | 2830 | 2c33 | 3329 | 2c33 | 322c | 3332 | 3b74 | 7970 | 655f | 5f38 | 4765 | 6e56 | 616c | 7565 | 3a28 | 302c | 3334 | 292c | 3634 |
| 2731660 | 2c33 | 323b | 5f5f | 4f35 | 375f | 5f38 | 4765 | 6e56 | 616c | 7565 | 3a28 | 302c | 3130 | 3729 | 2c39 | 362c | 3332 | 3b3b | 0047 | 656e | 5661 | 6c75 | 653a | 5a63 |
| 2731740 | 4765 | 6e56 | 616c | 7565 | 3b4e | 4f62 | 6a65 | 6374 | 3b5f | 5f63 | 745f | 5f38 | 4765 | 6e56 | 616c | 7565 | 4676 | 205f | 5f63 | 745f | 5f38 | 4765 | 6e56 | 616c |
| 2732020 | 7565 | 4652 | 4338 | 4765 | 6e56 | 616c | 7565 | 205f | 5f64 | 745f | 5f38 | 4765 | 6e56 | 616c | 7565 | 4676 | 2073 | 6574 | 5f47 | 656e | 5661 | 6c75 | 655f | 7479 |
| 2732100 | 7065 | 5f5f | 3847 | 656e | 5661 | 6c75 | 6546 | 5063 | 6920 | 7365 | 745f | 4765 | 6e56 | 616c | 7565 | 5f74 | 7970 | 655f | 5f38 | 4765 | 6e56 | 616c | 7565 | 4631 |
| 2732160 | 3056 | 616c | 7565 | 5f54 | 7970 | 6520 | 7365 | 745f | 4765 | 6e56 | 616c | 7565 | 5f5f | 3847 | 656e | 5661 | 6c75 | 6546 | 5063 | 205c | 0073 | 6574 | 5f47 | 656e |
| 2732240 | 5661 | 6c75 | 655f | 5f38 | 4765 | 6e56 | 616c | 7565 | 4669 | 2073 | 6574 | 5f47 | 656e | 5661 | 6c75 | 655f | 5f38 | 4765 | 6e56 | 616c | 7565 | 4666 | 2067 | 6574 |
| 2732320 | 5f47 | 656e | 5661 | 6c75 | 655f | 7479 | 7065 | 5f5f | 3847 | 656e | 5661 | 6c75 | 6546 | 7620 | 6765 | 745f | 4765 | 6e56 | 616c | 7565 | 5f73 | 5f5f | 3847 | 656e |
| 2732400 | 5661 | 6c75 | 6546 | 7620 | 6765 | 745f | 4765 | 6e56 | 616c | 7565 | 5f69 | 5f5f | 3847 | 656e | 5661 | 6c75 | 6546 | 7620 | 6765 | 745f | 4765 | 6e56 | 616c | 7565 |
| 2732460 | 5f66 | 5f5f | 3847 | 656e | 5661 | 6c75 | 6546 | 7620 | 6579 | 706c | 6169 | 6e5f | 5f38 | 4765 | 6e56 | 616c | 7565 | 4650 | 6320 | 5c00 | 6368 | 6563 | 6b5f | 5f38 |
| 2732540 | 4765 | 6e56 | 616c | 7565 | 4669 | 203b | 3b3b | 005f | 5f70 | 7462 | 6c5f | 5f38 | 4765 | 6e56 | 616c | 7565 | 5f5f | 416c | 6c42 | 6c6f | 636b | 735f | 315f | 6378 |
| 2732620 | 783a | 4728 | 302c | 3533 | 2900 | 7061 | 7261 | 6d65 | 7465 | 723a | 5428 | 302c | 3130 | 3929 | 3d73 | 3630 | 5f5f | 7670 | 7472 | 5f5f | 364f | 626a | 6563 | 743a |
| 2732700 | 2830 | 2c35 | 3329 | 2c30 | 2c33 | 323b | 6e61 | 6d65 | 5f5f | 374e | 4f62 | 6a65 | 6374 | 3a28 | 302c | 3333 | 292c | 3332 | 2c33 | 323b | 6e61 | 6d65 | 5f5f | 3970 |
| 2732760 | 6172 | 616d | 6574 | 6572 | 3a28 | 302c | 3333 | 292c | 3634 | 2c33 | 323b | 7479 | 7065 | 5f5f | 3970 | 6172 | 616d | 6574 | 6572 | 3a28 | 302c | 3333 | 292c | 3936 |
| 2733040 | 2c33 | 323b | 7261 | 6e67 | 655f | 5f39 | 7061 | 7261 | 6d65 | 7465 | 723a | 2830 | 2c33 | 3329 | 2c31 | 3238 | 2c33 | 323b | 736c | 6963 | 655f | 5f39 | 7061 | 7261 |
| 2733120 | 6d65 | 7465 | 723a | 2830 | 2c33 | 3329 | 2c31 | 3630 | 2c33 | 323b | 536c | 6f77 | 5f5f | 3970 | 6172 | 616d | 6574 | 6572 | 3a28 | 302c | 3129 | 2c31 | 3932 | 2c33 |
| 2733200 | 323b | 5368 | 6967 | 685f | 5f39 | 7061 | 7261 | 6d65 | 7465 | 723a | 2830 | 2c31 | 292c | 3232 | 342c | 3332 | 3b5c | 0050 | 436c | 6173 | 735f | 5f39 | 7061 | 7261 |
| 2733260 | 6d65 | 7465 | 723a | 2830 | 2c33 | 3829 | 2c32 | 3536 | 2c33 | 323b | 5058 | 5265 | 665f | 5f39 | 7061 | 7261 | 6d65 | 7465 | 723a | 2830 | 2c31 | 3130 | 293d | 2a28 |
| 2733340 | 302c | 3130 | 3929 | 2c32 | 3838 | 2c33 | 323b | 6d6f | 6465 | 5f5f | 3970 | 6172 | 616d | 6574 | 6572 | 3a28 | 302c | 3337 | 292c | 3332 | 302c | 3332 | 3b76 | 616c |
| 2733420 | 7565 | 5f5f | 3970 | 6172 | 616d | 6574 | 6572 | 3a28 | 302c | 3130 | 3829 | 2c33 | 3532 | 2c31 | 3238 | 3b3b | 0070 | 6172 | 616d | 6574 | 6572 | 3a5a | 6370 | 6172 |
| 2733500 | 616d | 6574 | 6572 | 3b4e | 4f62 | 6a65 | 6374 | 3b5f | 5f63 | 745f | 5f39 | 7061 | 7261 | 6d65 | 7465 | 7246 | 7620 | 5f5f | 6374 | 5f5f | 3970 | 6172 | 616d | 6574 |
| 2733560 | 6572 | 4652 | 4339 | 7061 | 7261 | 6d65 | 7465 | 7220 | 5f5f | 6474 | 5f5f | 3970 | 6172 | 616d | 6574 | 6572 | 4676 | 2067 | 6574 | 5f70 | 6172 | 616d | 6574 | 6572 |
| 2733640 | 5f6d | 6f64 | 655f | 5f39 | 7061 | 7261 | 6d65 | 7465 | 7246 | 7620 | 6765 | 745f | 7061 | 7261 | 6d65 | 7465 | 725f | 636c | 6173 | 735f | 5f39 | 7061 | 7261 | 6d65 |
| 2733720 | 7465 | 7246 | 7620 | 6765 | 745f | 7061 | 7261 | 5f73 | 6c6f | 775f | 5f39 | 7061 | 7261 | 6d65 | 7465 | 7246 | 7620 | 5c00 | 6765 | 745f | 7061 | 7261 | 5f73 | 6869 |
| 2734000 | 6768 | 5f5f | 3970 | 6172 | 616d | 6574 | 6572 | 4676 | 2067 | 6574 | 5f70 | 6172 | 616d | 6574 | 6572 | 5f72 | 616e | 6765 | 5f5f | 3970 | 6172 | 616d | 6574 | 6572 |
| 2734060 | 4676 | 2067 | 6574 | 5f70 | 6172 | 616d | 6574 | 6572 | 5f74 | 7970 | 655f | 5f39 | 7061 | 7261 | 6d65 | 7465 | 7246 | 7620 | 6765 | 745f | 7061 | 7261 | 6d65 | 7465 |
| 2734140 | 725f | 6e61 | 6d65 | 5f5f | 3970 | 6172 | 616d | 6574 | 6572 | 4676 | 2067 | 6574 | 5f70 | 6172 | 6161 | 6574 | 6572 | 5f73 | 6c69 | 6365 | 5f5f | 3970 | 6172 | 616d |
| 2734220 | 6574 | 6572 | 4676 | 2067 | 6574 | 5f70 | 6172 | 616d | 6574 | 6572 | 5f50 | 5852 | 4546 | 5f5f | 3970 | 6172 | 616d | 6574 | 6572 | 4631 | 3050 | 6172 | 615f | 436c |

```
2734300 6173 7320 5c00 6765 745f 636f 7272 6563 745f 6c65 6e67 7468 5f5f 3970 6172 616d 6574 6572 4676 2067 6574 5f70 6172 615f
2734360 6c65 6e67 7468 5f5f 3970 6172 616d 6574 6572 4676 2067 6574 5f70 6172 615f 7374 6174 7573 5f5f 3970 6172 616d 6574 6572
2734440 4676 2067 6574 5f70 6172 616d 6574 6572 5f76 616c 7565 5f5f 3970 6172 616d 6574 6572 4676 2067 6574 5f70 6172 616d 6574
2734520 6572 5f76 616c 7565 5f74 7970 655f 5f39 7061 7261 6d65 7465 7246 7620 6765 745f 7061 7261 6d65 7465 725f 7376 616c 7565
2734600 5f5f 3970 6172 616d 6574 6572 4676 205c 0067 6574 5f70 6172 616d 6574 6572 5f69 7661 6c75 655f 5f39 7061 7261 6d65 7465
2734660 7246 7620 6765 745f 7061 7261 6d65 7465 725f 6676 616c 7565 5f5f 3970 6172 616d 6574 6572 4676 2073 6574 5f70 6172 616d
2734740 6574 6572 5f6e 616d 655f 5f39 7061 7261 6d65 7465 7246 5063 2073 6574 5f70 6172 616d 6574 6572 5f63 6c61 7373 5f5f 3970
2735020 6172 616d 6574 6572 4631 3050 6172 615f 436c 6173 7320 7365 745f 7061 7261 6d65 7465 725f 7479 7065 5f5f 3970 6172 616d
2735100 6574 6572 4650 6320 7365 745f 7061 7261 6d65 7465 725f 736c 6963 655f 5f39 7061 7261 6d65 7465 7246 5063 205c 0073 6574
2735160 5f70 6172 616d 6574 6572 5f73 7261 6e67 655f 5f39 7061 7261 6d65 7465 7246 5063 2073 6574 5f70 6172 616d 6574 6572 5f50
2735240 5852 6566 5f5f 3970 6172 616d 6574 6572 4650 6350 3562 6c6f 636b 2073 6574 5f70 6172 616d 6574 6572 5f72 616e 6765 5f5f
2735320 3970 6172 616d 6574 6572 4650 6320 7365 745f 7061 7261 6d65 7465 725f 6d6f 6465 5f5f 3970 6172 616d 6574 6572 4650 6320
2735400 7365 745f 7061 7261 6d65 7465 725f 7661 6c75 655f 5f39 7061 7261 6d65 7465 7246 5063 2073 6574 5f70 6172 616d 6574 6572
2735460 5f76 616c 7565 5f5f 3970 6172 616d 6574 6572 4669 205c 0073 6574 5f70 6172 616d 6574 6572 5f76 616c 7565 5f5f 3970 6172
2735540 616d 6574 6572 4666 2073 6574 5f70 6172 616d 6574 6572 5f76 616c 7565 5f74 7970 655f 5f39 7061 7261 6d65 7465 7246 5063
2735620 2067 6574 5f56 4944 4c5f 466f 726d 616c 5f50 6172 616d 5f5f 3970 6172 616d 6574 6572 4650 6369 2067 6574 5f56 4844 4c5f
2735700 5072 6d74 725f 5f39 7061 7261 6d65 7465 7246 5063 6920 6765 745f 5648 444c 5f45 7870 616e 6465 645f 466f 726d 616c 5f50
2735760 6172 616d 5f5f 3970 6172 616d 6574 6572 4650 3562 6c6f 636b 5063 6920 5c00 6765 745f 5648 444c 5f45 7870 616e 6465 645f
2736040 5072 6d74 725f 4d61 705f 5f39 7061 7261 6d65 7465 7246 5035 626c 6f63 6b50 6369 2065 7870 6c61 696e 5f5f 3970 6172 616d
2736120 6574 6572 4650 6320 3b3b 3b00 5f5f 7074 626c 5f5f 3970 6172 616d 6574 6572 5f5f 416c 6c42 6c6f 636b 735f 315f 6378 783a
2736200 4728 302c 3533 2900 626c 6f63 6b5f 6174 7472 6962 7574 6573 3a54 2830 2c31 3131 293d 7332 385f 5f76 7074 725f 5f36 4f62
2736260 6a65 6374 3a28 302c 3533 292c 302c 3332 3b6e 616d 655f 5f37 4e4f 626a 6563 743a 2830 2c33 3329 2c33 322c 3332 3b6e 616d
2736340 655f 5f31 3662 6c6f 636b 5f61 7474 7269 6275 7465 733a 2830 2c33 3329 2c36 342c 3332 3b76 616c 7565 5f5f 3136 626c 6f63
2736420 6b5f 6174 7472 6962 7574 6573 3a28 302c 3130 3829 2c39 362c 3132 383b 3b00 626c 6f63 6b5f 6174 7472 6962 7574 6573 3a5a
2736500 6362 6c6f 636b 5f61 7474 7269 6275 7465 733b 4e4f 626a 6563 743b 5f5f 6374 5f5f 3136 626c 6f63 6b5f 6174 7472 6962 7574
2736560 6573 4650 6320 5f5f 6374 5f5f 3136 626c 6f63 6b5f 6174 7472 6962 7574 6573 4676 205f 5f63 745f 5f31 3662 6c6f 636b 5f61
2736640 7474 7269 6275 7465 7346 5243 3136 626c 6f63 6b5f 6174 7472 6962 7574 6573 205f 5f64 745f 5f31 3662 6c6f 636b 5f61 7474
2736720 7269 6275 7465 7346 7620 7365 745f 6174 7472 6962 7574 655f 6e61 6d65 5f5f 3136 626c 6f63 6b5f 6174 7472 6962 7574 6573
2737000 4650 6320 5c00 7365 745f 6174 7472 6962 7574 655f 7661 6c75 655f 5f31 3662 6c6f 636b 5f61 7474 7269 6275 7465 7346 5063
2737060 2073 6574 5f61 7474 7269 6275 7465 5f76 616c 7565 5f5f 3136 626c 6f63 6b5f 6174 7472 6962 7574 6573 4669 2073 6574 5f61
2737140 7474 7269 6275 7465 5f76 616c 7565 5f5f 3136 626c 6f63 6b5f 6174 7472 6962 7574 6573 4666 2073 6574 5f61 7474 7269 6275
2737220 7465 5f74 7970 655f 5f31 3662 6c6f 636b 5f61 7474 7269 6275 7465 7346 5063 2067 6574 5f61 7474 7269 6275 7465 5f6e 616d
2737300 655f 5f31 3662 6c6f 636b 5f61 7474 7269 6275 7465 7346 7620 5c00 6765 745f 6174 7472 6962 7574 655f 7479 7065 5f5f 3136
2737360 626c 6f63 6b5f 6174 7472 6962 7574 6573 4676 2067 6574 5f61 7474 7269 6275 7465 5f73 7661 6c75 655f 5f31 3662 6c6f 636b
2737440 5f61 7474 7269 6275 7465 7346 7620 6765 745f 6174 7472 6962 7574 655f 6976 616c 7565 5f5f 3136 626c 6f63 6b5f 6174 7472
2737520 6962 7574 6573 4676 2067 6574 5f61 7474 7269 6275 7465 5f66 7661 6c75 655f 5f31 3662 6c6f 636b 5f61 7474 7269 6275 7465
2737600 7346 7620 6765 745f 6174 7472 6962 7574 655f 7661 6c75 655f 5f31 3662 6c6f 636b 5f61 7474 7269 6275 7465 7346 7620 5c00
2737660 6578 706c 6169 6e5f 5f31 3662 6c6f 636b 5f61 7474 7269 6275 7465 7346 5063 203b 3b3b 005f 5f70 7462 6c5f 5f31 3662 6c6f
2737740 636b 5f61 7474 7269 6275 7465 735f 5f41 6c6c 426c 6f63 6b73 5f31 5f63 7878 3a47 2830 2c35 3329 0065 6e74 6974 793a 5428
2740020 302c 3131 3229 3173 3630 5f5f 7670 7472 5f5f 364f 626a 6563 743a 2830 2c35 3329 2c30 2c33 323b 6e61 6d65 5f5f 374e 4f62
2740100 6a65 6374 3a28 302c 3333 292c 3332 2c33 323b 6e61 6d65 5f5f 3665 6e74 6974 793a 2830 2c33 3329 2c36 342c 3332 3b46 696c
2740160 654e 616d 655f 5f36 656e 7469 7479 3a28 302c 3333 292c 3936 2c33 323b 6172 6368 6e61 6d65 5f5f 3665 6e74 6974 793a 2830
2740240 2c33 3329 2c31 3238 2c33 323b 7479 7065 5f5f 3665 6e74 6974 793a 2830 2c31 292c 3136 302c 3332 3b61 7263 685f 6c69 6e65
2740320 5f5f 3665 6e74 6974 793a 2830 2c31 292c 3139 322c 3332 3b63 616c 6c5f 6c69 6e65 5f5f 3665 6e74 6974 793a 2830 2c31 292c
2740400 3232 342c 3332 3b5c 0070 7263 735f 6c69 6e65 5f5f 3665 6e74 6974 793a 2830 2c31 292c 3235 362c 3332 3b71 7561 6c69 6669
2740460 6564 5f5f 3665 6e74 6974 793a 2830 2c31 3031 292c 3238 382c 3936 3b73 7562 5f62 6c6f 636b 735f 5f36 656e 7469 7479 3a28
2740540 302c 3130 3129 2c33 3834 2c39 363b 3b00 656e 7469 7479 3a5a 6365 6e74 6974 793b 4e4f 626a 6563 743b 5f5f 6374 5f5f 3665
2740620 6e74 6974 7946 7620 5f5f 6374 5f5f 3665 6e74 6974 7946 5243 3665 6e74 6974 7920 5f5f 6474 5f5f 3665 6e74 6974 7946 7620
2740700 7365 745f 656e 7469 7479 5f6e 616d 655f 5f36 656e 7469 7479 4650 6320 7365 745f 656e 7469 7479 5f66 696c 655f 5f36 656e
2740760 7469 7479 4650 6320 7365 745f 656e 7469 7479 5f61 7263 686e 616d 655f 5f36 656e 7469 7479 4650 6320 7365 745f 656e 7469
2741040 7479 5f74 7970 655f 5f36 656e 7469 7479 4650 6320 5c00 7365 745f 6172 6368 5f6c 696e 655f 5f36 656e 7469 7479 4669 2073
2741120 6574 5f63 616c 6c5f 6c69 6e65 5f5f 3665 6e74 6974 7946 6920 7365 745f 7072 6373 5f6c 696e 655f 5f36 656e 7469 7479 4669
2741200 2067 6574 5f65 6e74 6974 795f 6e61 6d65 5f5f 3665 6e74 6974 7946 7620 6765 745f 656e 7469 7479 5f61 7263 686e 616d 655f
2741260 5f36 656e 7469 7479 4676 2067 6574 5f65 6e74 6974 795f 6669 6c65 5f5f 3665 6e74 6974 7946 7620 6765 745f 656e 7469 7479
2741340 5f74 7970 655f 5f36 656e 7469 7479 4676 205c 0067 6574 5f61 7263 685f 6c69 6e65 5f5f 3665 6e74 6974 7946 7620 6765 745f
```

| | | | | | | | | | | | | | | | | | | | | | | | | |
|---|---|---|---|---|---|---|---|---|---|---|---|---|---|---|---|---|---|---|---|---|---|---|---|---|
| 2741420 | 6361 | 6c6c | 5f6c | 696e | 655f | 5f36 | 656e | 7469 | 7479 | 4676 | 2067 | 6574 | 5f70 | 7263 | 735f | 6c69 | 6e65 | 5f5f | 3665 | 6e74 | 6974 | 7946 | 7620 | 6973 |
| 2741500 | 4754 | 455f | 5f36 | 656e | 7469 | 7479 | 4650 | 364f | 626a | 6563 | 7420 | 6973 | 4c54 | 455f | 5f36 | 656e | 7469 | 7479 | 4650 | 364f | 626a | 6563 | 7420 | 6578 |
| 2741560 | 706c | 6169 | 6e5f | 5f36 | 656e | 7469 | 7479 | 4650 | 6320 | 3b3b | 3b00 | 5f5f | 7074 | 626c | 5f5f | 3665 | 6e74 | 6974 | 795f | 5f41 | 6c6c | 426c | 6f63 | 6b73 |
| 2741640 | 5f31 | 5f63 | 7878 | 3a47 | 2830 | 2c35 | 3329 | 0062 | 5c6f | 636b | 3a54 | 2830 | 2c31 | 3133 | 293d | 7331 | 3430 | 5f5f | 7670 | 7472 | 5f5f | 364f | 626a | 6563 |
| 2741720 | 743a | 2830 | 2c35 | 3329 | 2c30 | 2c33 | 323b | 6e61 | 6d65 | 5f5f | 374e | 4f62 | 6365 | 6374 | 3a28 | 302c | 3333 | 292c | 3332 | 2c33 | 323b | 6e61 | 6d65 | 5f5f |
| 2742000 | 3562 | 6c6f | 636b | 3a28 | 302c | 3333 | 292c | 3634 | 2c33 | 323b | 7479 | 7065 | 5f5f | 3562 | 6c6f | 636b | 3a28 | 302c | 3129 | 2c39 | 362c | 3332 | 3b4d | 475f |
| 2742060 | 4e61 | 6d65 | 5f5f | 3562 | 6c6f | 636b | 3a28 | 302c | 3333 | 292c | 3132 | 382c | 3332 | 3b4d | 475f | 5479 | 7065 | 5f5f | 3562 | 6c6f | 636b | 3a28 | 302c | 3333 |
| 2742140 | 292c | 3136 | 302c | 3332 | 3b4d | 475f | 5375 | 6254 | 7970 | 655f | 5f35 | 626c | 6f63 | 6b3a | 2830 | 2c33 | 3329 | 2c31 | 3932 | 2c33 | 323b | 5061 | 7265 | 6e74 |
| 2742220 | 5f5f | 3562 | 6c6f | 636b | 3a28 | 302c | 3131 | 3229 | 2c32 | 3234 | 2c34 | 3830 | 3b5c | 004d | 4744 | 7363 | 7270 | 746e | 5f5f | 3562 | 6c6f | 636b | 3a28 | 302c |
| 2742300 | 3131 | 3429 | 3d2a | 2930 | 2c31 | 3035 | 292c | 3730 | 342c | 3332 | 3b41 | 6374 | 7561 | 6c5f | 5f35 | 626c | 6f63 | 6b3a | 2830 | 2c31 | 3031 | 292c | 3733 | 362c |
| 2742360 | 3936 | 3b46 | 6f72 | 6161 | 6c5f | 5f35 | 626c | 6f63 | 6b3a | 2830 | 2c31 | 3031 | 292c | 3833 | 322c | 3936 | 3b52 | 6573 | 6f6c | 7665 | 645f | 5f35 | 626c | 6f63 |
| 2742440 | 6b3a | 2830 | 2c31 | 3031 | 292c | 3932 | 382c | 3936 | 3b41 | 7474 | 7269 | 6275 | 7465 | 735f | 5f35 | 626c | 6f63 | 6b3a | 2830 | 2c31 | 3031 | 292c | 3130 | 3234 |
| 2742520 | 2c39 | 363b | 3b00 | 626c | 6f63 | 6b3a | 5a63 | 626c | 6f63 | 6b3b | 4e4f | 626a | 6563 | 743b | 5f5f | 6374 | 5f5f | 3562 | 6c6f | 636b | 4676 | 205f | 5f63 | 745f |
| 2742600 | 5f35 | 626c | 6f63 | 6b46 | 5243 | 3562 | 6c6f | 636b | 205f | 5f64 | 745f | 5f35 | 626c | 6f63 | 6b46 | 7620 | 7365 | 745f | 626c | 6f63 | 6b5f | 6e61 | 6d65 | 5f5f |
| 2742660 | 3562 | 6c6f | 636b | 4650 | 6320 | 7365 | 745f | 626c | 6f63 | 6b5f | 7479 | 7065 | 5f5f | 3562 | 6c6f | 636b | 4650 | 6320 | 6765 | 745f | 626c | 6f63 | 6b5f | 6e61 |
| 2742740 | 6d65 | 5f5f | 3562 | 6c6f | 636b | 4676 | 2067 | 6574 | 5f62 | 6c6f | 636b | 5f74 | 7970 | 655f | 5f35 | 626c | 6f63 | 6b46 | 7620 | 6765 | 745f | 626c | 6f63 | 6b5f |
| 2743020 | 7061 | 7265 | 6e74 | 5f5f | 3562 | 6c6f | 636b | 4676 | 205c | 0067 | 6574 | 5f62 | 6c6f | 636b | 5f4d | 6f64 | 4765 | 6e5f | 5f35 | 626c | 6f63 | 6b46 | 7620 | 6765 |
| 2743100 | 745f | 466f | 726d | 616c | 5f5f | 3562 | 6c6f | 636b | 4676 | 2067 | 6574 | 5f41 | 6374 | 7561 | 6c5f | 5f35 | 626c | 6f63 | 6b46 | 7620 | 6765 | 745f | 5265 | 736f |
| 2743160 | 6c76 | 6564 | 5f5f | 3562 | 6c6f | 636b | 4676 | 2067 | 6574 | 5f41 | 7474 | 7269 | 6275 | 7465 | 5f5f | 3562 | 6c6f | 636b | 4676 | 2067 | 6574 | 5f63 | 6f6d | 705f |
| 2743240 | 6c65 | 6e67 | 7468 | 5f5f | 3562 | 6c6f | 636b | 4676 | 2069 | 7351 | 7561 | 6c69 | 6669 | 6564 | 5f5f | 3562 | 6c6f | 636b | 4676 | 2069 | 734c | 5445 | 5f5f | 3562 |
| 2743320 | 6c6f | 636b | 4650 | 364f | 626a | 6563 | 7420 | 5c00 | 6973 | 4754 | 455f | 5f35 | 626c | 6f63 | 6b46 | 5036 | 4f62 | 6a65 | 6374 | 2065 | 7870 | 6c61 | 696e | 5f5f |
| 2743400 | 3562 | 6c6f | 636b | 4650 | 6320 | 5265 | 7665 | 7273 | 6541 | 6c6c | 4c69 | 7374 | 735f | 5f35 | 626c | 6f63 | 6b46 | 7620 | 4368 | 6563 | 6b50 | 6172 | 614c | 6973 |
| 2743460 | 7473 | 5f5f | 3562 | 6c6f | 636b | 4676 | 2043 | 6865 | 636b | 5061 | 7261 | 634c | 6973 | 745f | 5f35 | 626c | 6f63 | 6b46 | 5035 | 504c | 6973 | 7420 | 575f | 5648 |
| 2743540 | 444c | 5f43 | 6f6d | 7049 | 6e73 | 745f | 5f35 | 626c | 6f63 | 6b46 | 7620 | 575f | 5648 | 444c | 5f43 | 6f6d | 7044 | 6563 | 5f5f | 3562 | 6c6f | 636b | 4676 | 2067 |
| 2743620 | 6574 | 5f56 | 4844 | 4c5f | 436f | 6d70 | 4c61 | 626c | 655f | 5f35 | 626c | 6f63 | 6b46 | 5063 | 205c | 0067 | 6574 | 5f56 | 4944 | 4c5f | 436f | 6d70 | 4e61 | 6d65 |
| 2743700 | 5f5f | 3562 | 6c6f | 636b | 4650 | 6320 | 575f | 4d47 | 5f43 | 6f6d | 7044 | 7363 | 7270 | 746e | 5f5f | 3562 | 6c6f | 636b | 4676 | 2057 | 5f4d | 475f | 4368 | 6563 |
| 2743760 | 6b43 | 6f6d | 705f | 5f35 | 626c | 6f63 | 6b46 | 7620 | 575f | 434c | 5f41 | 7263 | 6842 | 6f64 | 795f | 5f35 | 626c | 6f63 | 6b46 | 7620 | 575f | 434c | 5f45 | 6e74 |
| 2744040 | 6974 | 7944 | 6563 | 5f5f | 3562 | 6c6f | 636b | 4676 | 203b | 3b3b | 005f | 5f70 | 7462 | 6c5f | 5f35 | 626c | 6f63 | 6b5f | 5f41 | 6c6c | 426c | 6f63 | 6b73 | 5f31 |
| 2744120 | 5f63 | 7878 | 3a47 | 2830 | 2c35 | 3329 | 005f | 5f63 | 745f | 5f36 | 656e | 7469 | 7479 | 4676 | 3a66 | 2830 | 2c31 | 3135 | 293d | 2a28 | 302c | 3131 | 3229 | 005f |
| 2744200 | 5f30 | 7468 | 6973 | 3a70 | 2830 | 2c31 | 3135 | 2900 | 2e2f | 6878 | 782f | 656e | 7469 | 7479 | 2e68 | 7878 | 005f | 5f30 | 7468 | 6973 | 3a72 | 2830 | 2c31 | 3135 |
| 2744260 | 2900 | 5f5f | 3074 | 6869 | 7320 | 3a5a | 746c | 005f | 5f63 | 745f | 5f36 | 656e | 7469 | 7479 | 4676 | 203a | 5a74 | 4600 | 4465 | 7369 | 676e | 556e | 6974 | 3a54 |
| 2744340 | 2830 | 2c31 | 3136 | 293d | 7335 | 325f | 5f76 | 7074 | 725f | 5f36 | 4f62 | 6a65 | 6374 | 3a28 | 302c | 3533 | 292c | 302c | 3332 | 3b6e | 616d | 655f | 5f37 | 4e4f |
| 2744420 | 626a | 6563 | 743a | 2830 | 2c33 | 3329 | 2c33 | 322c | 3332 | 3b44 | 6555 | 6e4e | 616d | 655f | 5f31 | 3044 | 6573 | 6967 | 6e55 | 6e69 | 743a | 2830 | 2c33 | 3329 |
| 2744500 | 2c36 | 342c | 3332 | 3b46 | 696c | 654e | 616d | 655f | 5f31 | 3044 | 6573 | 6967 | 6e55 | 6e69 | 743a | 2830 | 2c33 | 3329 | 2c39 | 362c | 3332 | 3b41 | 7263 | 684e |
| 2744560 | 616d | 655f | 5f31 | 3044 | 6573 | 6967 | 6e55 | 6e69 | 743a | 2830 | 2c33 | 3329 | 2c31 | 3238 | 2c33 | 323b | 4465 | 556e | 5479 | 7065 | 5f5f | 3130 | 4465 | 7369 |
| 2744640 | 676e | 556e | 6974 | 3a28 | 302c | 3129 | 2c31 | 3630 | 2c33 | 323b | 4172 | 6368 | 4c69 | 6e65 | 5f5f | 3130 | 4465 | 7369 | 676e | 556e | 6974 | 3a28 | 302c | 3129 |
| 2744720 | 2c31 | 3932 | 2c33 | 323b | 5175 | 616c | 6966 | 6965 | 645f | 5f31 | 3044 | 6573 | 6967 | 6e55 | 6e69 | 743a | 2830 | 2c31 | 3031 | 292c | 3232 | 342c | 3936 | 3b53 |
| 2745000 | 7562 | 426c | 6f63 | 6b73 | 5f5f | 3130 | 4465 | 7369 | 676e | 556e | 6974 | 3a28 | 302c | 3130 | 3129 | 2c33 | 3230 | 2c39 | 363b | 3b00 | 4465 | 7369 | 676e | 556e |
| 2745060 | 6974 | 3a5a | 6344 | 6573 | 6967 | 6e55 | 6e69 | 743b | 4e4f | 626a | 6563 | 743b | 5f5f | 6374 | 5f5f | 3130 | 4465 | 7369 | 676e | 556e | 6974 | 4676 | 205f | 5f63 |
| 2745140 | 745f | 5f31 | 3044 | 6573 | 6967 | 6e55 | 6e69 | 7446 | 5063 | 205f | 5f63 | 745f | 5f31 | 3044 | 6573 | 6967 | 6e55 | 6e69 | 7446 | 5036 | 656e | 7469 | 7479 | 205f |
| 2745220 | 5f63 | 745f | 5f31 | 3044 | 6573 | 6967 | 6e55 | 6e69 | 7446 | 5243 | 3130 | 4465 | 7369 | 676e | 556e | 6974 | 205f | 5f64 | 745f | 5f31 | 3044 | 6573 | 6967 | 6e55 |
| 2745300 | 6e69 | 7446 | 7620 | 7365 | 745f | 4455 | 5f44 | 6555 | 6e4e | 616d | 655f | 5f31 | 3044 | 6573 | 6967 | 6e55 | 6e69 | 7446 | 5063 | 205c | 0073 | 6574 | 5f44 | 555f |
| 2745360 | 4669 | 6c65 | 4e61 | 6d65 | 5f5f | 3130 | 4465 | 7369 | 676e | 556e | 6974 | 4650 | 6320 | 7365 | 745f | 4455 | 5f41 | 7263 | 684e | 616d | 655f | 5f31 | 3044 | 6573 |
| 2745440 | 6967 | 6e55 | 6e69 | 7446 | 5063 | 2073 | 6574 | 5f44 | 555f | 4465 | 556e | 5479 | 7065 | 5f5f | 3130 | 4465 | 7369 | 676e | 556e | 6974 | 4669 | 2073 | 6574 | 5f44 |
| 2745520 | 555f | 4172 | 6368 | 4c69 | 6e65 | 5f5f | 3130 | 4465 | 7369 | 676e | 556e | 6974 | 4669 | 2067 | 6574 | 5f44 | 555f | 4669 | 6c65 | 4e61 | 6d65 | 5f5f | 3130 | 4465 |
| 2745600 | 7369 | 676e | 556e | 6974 | 4676 | 2045 | 7175 | 616c | 5f5f | 3130 | 4465 | 7369 | 676e | 556e | 6974 | 4650 | 3665 | 6e74 | 6974 | 7920 | 5c00 | 6973 | 4754 | 455f |
| 2745660 | 5f31 | 3044 | 6573 | 6967 | 6e55 | 6e69 | 7446 | 5036 | 4f62 | 6a65 | 6374 | 2069 | 734c | 5445 | 5f5f | 3130 | 4465 | 7369 | 676e | 556e | 6974 | 4650 | 364f | 626a |
| 2745740 | 6563 | 7420 | 6765 | 745f | 4455 | 5f51 | 7561 | 6c69 | 6669 | 6564 | 5f5f | 3130 | 4465 | 7369 | 676e | 556e | 6974 | 4676 | 2067 | 6574 | 5f44 | 555f | 5375 | 6242 |
| 2746020 | 6c6f | 636b | 735f | 5f31 | 3044 | 6573 | 6967 | 6e55 | 6e69 | 7446 | 7620 | 4578 | 7361 | 6e64 | 5f56 | 4844 | 4c5f | 4455 | 5f5f | 3130 | 4465 | 7369 | 676e | 556e |
| 2746100 | 6974 | 4676 | 2065 | 7870 | 6c61 | 696e | 5f5f | 3130 | 4465 | 7369 | 676e | 556e | 6974 | 4650 | 6320 | 3b3b | 3b00 | 5f5f | 7074 | 626c | 5f5f | 3130 | 4465 | 7369 |
| 2746160 | 676e | 556e | 6974 | 5f5f | 416c | 6c42 | 6c6f | 636b | 735f | 315f | 6378 | 783a | 4728 | 302c | 3533 | 2900 | 4669 | 6c65 | 556e | 6974 | 3a54 | 2830 | 2c31 | 3137 |
| 2746240 | 293d | 7332 | 345f | 5f76 | 7074 | 725f | 5f36 | 4f62 | 6a65 | 6374 | 3a28 | 302c | 3533 | 292c | 302c | 3332 | 3b6e | 616d | 655f | 5f37 | 4e4f | 626a | 6563 | 743a |
| 2746320 | 2830 | 2c33 | 3329 | 2c33 | 322c | 3332 | 3b46 | 696c | 654e | 616d | 655f | 5f38 | 4669 | 6c65 | 556e | 6974 | 3a28 | 302c | 3333 | 292c | 3634 | 2c33 | 323b | 456e |
| 2746400 | 7469 | 7479 | 4c69 | 7374 | 5f5f | 3846 | 696c | 6555 | 6e69 | 743a | 2830 | 2c31 | 3031 | 292c | 3936 | 2c39 | 363b | 3b00 | 4669 | 6c65 | 556e | 6974 | 3a5a | 6346 |
| 2746460 | 696c | 6555 | 6e69 | 743b | 4e4f | 626a | 6563 | 743b | 5f5f | 6374 | 5f5f | 3846 | 696c | 6555 | 6e69 | 7446 | 7620 | 5f5f | 6374 | 5f5f | 3846 | 696c | 6555 | 6e69 |

```
2746540  7446 5063 205f 5f63 745f 5f38 4669 6c65 556e 6974 4652 4338 4669 6c65 556e 6974 205f 5f64 745f 5f38 4669 6c65 556e 6974
2746620  4676 2073 6574 5f46 555f 4669 6c65 4e61 6d65 5f5f 3846 696c 6555 6e69 7446 5063 2067 6574 5f46 555f 4669 6c65 4e61 6d65
2746700  5f5f 3846 696c 6555 6e69 7446 7620 6765 745f 456e 7469 7479 4c69 7374 5f5f 3846 696c 6555 6e69 7446 7620 5c00 4578 7061
2746760  6e64 5f56 4844 4c5f 4455 5f5f 3846 696c 6555 6e69 7446 7620 6578 706c 6169 6e5f 5f38 4669 6c65 556e 6974 4650 6320 3b3b
2747040  3b00 5f5f 7074 626c 5f5f 3846 696c 6555 6e69 745f 5f41 6c6c 426c 6f63 6b73 5f31 5f63 7878 3a47 2830 2c35 3329 0041 6c6c
2747120  426c 6f63 6b73 3154 2830 2c31 3138 293d 7334 345f 5f76 7074 725f 5f36 4f62 6a65 6374 3a28 302c 3533 292c 302c 3332 3b6e
2747200  616d 655f 5f37 4e4f 626a 6563 743a 2830 2c33 3329 2c33 322c 3332 3b42 6c6f 636b 4c69 7374 5f5f 3941 6c6c 426c 6f63 6b73
2747260  3a28 302c 3130 3129 2c36 342c 3936 3b44 554c 6973 745f 5f39 416c 6c42 6c6f 636b 733a 2830 2c31 3031 292c 3136 302c 3936
2747340  3b46 554c 6973 745f 5f39 416c 6c42 6c6f 636b 733a 2830 2c31 3031 292c 3235 362c 3936 3b3b 0041 6c6c 426c 6f63 6b73 3a5a
2747420  6341 6c6c 426c 6f63 6b73 3b4e 4f62 6a65 6374 3b5f 5f63 745f 5f39 416c 6c42 6c6f 636b 7346 7620 5f5f 6374 5f5f 3941 6c6c
2747500  426c 6f63 6b73 4652 4339 416c 6c42 6c6f 636b 7320 5f5f 6474 5f5f 3941 6c6c 426c 6f63 6b73 4676 2067 6574 5f42 6c6f 636b
2747560  4c69 7374 5f5f 3941 6c6c 426c 6f63 6b73 4676 2067 6574 5f44 554c 6973 745f 5f39 416c 6c42 6c6f 636b 7346 7620 6765 745f
2747640  4655 4c69 7374 5f5f 3941 6c6c 426c 6f63 6b73 4676 2052 6561 645f 5648 444c 5f42 6c6b 4669 6c65 5f5f 3941 6c6c 426c 6f63
2747720  6b73 4650 6320 5c00 5265 7665 7273 6550 6172 616d 4c69 7374 735f 5f39 416c 6c42 6c6f 636b 7346 7620 6d61 6b65 5f44 554c
2750000  6973 745f 5f39 416c 6c42 6c6f 636b 7346 7620 6d61 6b65 5f46 554c 6973 745f 5f39 416c 6c42 6c6f 636b 7346 7620 4578 7061
2750060  6e64 5f56 4844 4c5f 4655 5f5f 3941 6c6c 426c 6f63 6b73 4676 2065 7870 6c61 696e 5f5f 3941 6c6c 426c 6f63 6b73 4650 6320
2750140  3b3b 3b00 5f5f 7074 626c 5f5f 3941 6c6c 426c 6f63 6b73 5f5f 416c 6c42 6c6f 636b 735f 315f 6378 783a 4728 302c 3533 2900
2750220  505f 4b65 7973 3a54 2830 2c31 3139 293d 6544 756d 6d79 3a30 2c4e 756d 6265 723a 312c 4964 656e 7469 6669 6572 3a32 2c49
2750300  6e74 6567 6572 3a33 2c55 6e6b 6e6f 776e 3a34 2c53 656d 693a 352c 436f 6c6f 6e3a 362c 4571 7561 6c3a 372c 5c00 436f 6d6d
2750360  613a 382c 4451 756f 7465 733a 392c 5252 6272 6b74 3a31 302c 4c52 6272 6b74 3a31 312c 5243 6272 6b74 3a31 322c 4c43 6272
2750440  6b74 3a31 332c 5375 6242 6c6f 636b 3a31 342c 4b54 7970 653a 3135 2c5c 004b 4174 7472 6962 7574 653a 3136 2c4b 4174 723a
2750520  3137 2c4b 5661 6c75 653a 3138 2c4b 456e 7469 7479 4361 6c6c 3a31 392c 4b50 6172 616d 6574 6572 3a32 302c 5043 6f6e 7374
2750600  723a 3231 2c50 4469 723a 3232 2c4b 466f 726d 616c 3a32 332c 5c00 4b41 6374 7561 6c3a 3234 2c4b 5265 736f 6c76 6564 3a32
2750660  352c 4546 696c 653a 3236 2c45 4172 6368 3a32 372c 4543 616c 6c3a 3238 2c45 456e 7469 7479 3a32 392c 4541 7263 684e 616d
2750740  653a 3330 2c45 5479 7065 3a33 312c 5c00 4550 726f 6365 7373 3a33 322c 5046 6f72 6d61 6c3a 3333 2c50 536c 6963 653a 3334
2751020  2c3b 004c 3a47 2830 2c31 3230 293d 2a28 302c 3130 3129 0041 6c6c 426c 6f63 6b73 5f31 2e63 7878 0042 3a47 2830 2c31 3231
2751100  293d 2a28 302c 3131 3329 0045 3a47 2830 2c31 3135 2900 413a 4728 302c 3132 3229 3d2a 2830 2c31 3131 2900 503a 4728 302c
2751160  3131 3029 0056 3a47 2830 2c31 3233 293d 2a28 302c 3130 3829 006c 6e75 6d3a 4728 302c 3129 0074 7374 723a 4728 302c 3333
2751240  2900 5f5f 6374 5f5f 3562 6c6f 636b 4676 3a66 2830 2c31 3231 2900 5f5f 3074 6869 733a 7028 302c 3132 3129 002e 2f68 7878
2751320  2f62 6c6f 636b 2e68 7878 005f 5f30 7468 6973 3a72 2830 2c31 3231 2900 5f5f 3074 6869 7320 3a5a 746c 005f 5f63 745f 5f35
2751400  626c 6f63 6b46 7620 3a5a 7446 005f 5f63 745f 5f31 3662 6c6f 636b 5f61 7474 7269 6275 7465 7346 5063 3a66 2830 2c31 3232
2751460  2900 5f5f 3074 6969 733a 7028 302c 3132 3229 005f 5f30 733a 7028 302c 3333 2900 2e2f 6878 782f 6174 7472 6962 7574 652e
2751540  6878 7800 5f5f 3074 6869 733a 7228 302c 3132 3229 005f 5f30 7468 6973 203a 5a74 6c00 5f5f 3073 203a 5a74 6c00 5f5f 6374
2751620  5f5f 3136 626c 6f63 6b5f 6174 7472 6962 7574 6573 4650 6320 3a5a 7446 005f 5f63 745f 5f39 7061 7261 6d65 7465 7246 763a
2751700  6628 302c 3131 3029 005f 5f30 7468 6973 3a70 2830 2c31 3130 2900 2e2f 6878 782f 7061 7261 6d65 7465 722e 6878 7800 5f5f
2751760  3074 6869 733a 7228 302c 3131 3029 005f 5f30 7468 6973 203a 5a74 6c00 5f5f 6374 5f5f 3970 6172 616d 6574 6572 4676 203a
2752040  5a74 4600 5265 6164 5f56 4844 4c5f 426c 6b46 696c 655f 5f39 416c 6c42 6c6f 636b 7346 5063 3a46 2830 2c32 2900 5f5f 3074
2752120  6869 733a 7028 302c 3132 3429 332a 2830 2c31 3138 2900 5f5f 3062 6c6b 5f66 696c 655f 6e61 6d65 3a70 2830 2c33 3329 0041
2752200  6c6c 426c 6f63 6b73 5f31 2e63 7878 005f 5f30 7468 6973 3a72 2830 2c31 3234 2900 5f5f 316c 6578 746f 6b65 6e3a 2830 2c31
2752260  2900 5f5f 3169 645f 6973 3a28 302c 3129 005f 5f31 616e 6365 7374 6f72 3a28 302c 3129 005f 5f31 6964 5f65 7272 6f72 3a28
2752340  302c 3129 005f 5f31 6c65 7665 6c3a 2830 2c31 2900 5f5f 3146 5479 7065 3a28 302c 3129 005f 5f31 4656 616c 7565 3a28 302c
2752420  3129 005f 5f31 5061 7243 6c61 7373 3a28 302c 3338 2900 5f5f 3166 703a 2830 2c38 3829 005f 5f31 4f50 7472 3a28 302c 3132
2752500  3529 3d2a 2830 2c39 3829 005f 5f31 5061 724c 6973 743a 2830 2c31 3230 2900 5f5f 316c 6578 5f6d 656d 5f67 7270 3a28 302c
2752560  3330 2900 5f5f 305f 5f58 7468 6973 3030 7975 6379 6a6d 3a28 302c 3132 3529 005f 5f30 5f5f 586e 3030 7975 6379 6a6d 3a28
2752640  302c 3939 2900 5f5f 305f 5f59 7468 6973 3030 6175 6179 6b6f 3a28 302c 3937 2900 5f5f 305f 5f58 6f30 3061 7561 796b 6f3a
2752720  2830 2c39 3729 005f 5f30 5f5f 5874 6869 7330 3079 7372 326a 6d3a 2830 2c31 3231 2900 5f5f 305f 5f58 7468 6973 3030 697a
2753000  7232 6a6d 3a28 302c 3132 3129 005f 5f30 5f5f 5874 6869 7330 3071 3272 326a 6d3a 2830 2c31 3231 2900 5f5f 305f 5f58 7468
2753060  6973 3030 7935 7232 6a6d 3a28 302c 3132 3129 005f 5f30 5f5f 5874 6869 7330 3069 6872 326a 6d3a 7228 302c 3132 3129 005f
2753140  5f30 5f5f 5873 3030 6968 7232 6a6d 3a28 302c 3333 2900 5f5f 305f 5f58 7468 6973 3030 6164 7332 6a6d 3a28 302c 3132 3129
2753220  005f 5f30 5f5f 5874 6869 7330 3069 6163 326a 6d3a 7228 302c 3131 3529 005f 5f30 5f5f 5873 3030 6961 6332 6a6d 3a28 302c
2753300  3333 2900 5f5f 305f 5f58 7468 6973 3030 6966 6332 6a6d 3a28 302c 3131 3529 005f 5f30 5f5f 5873 3030 6966 6332 6a6d 3a28
2753360  302c 3333 2900 5f5f 305f 5f58 7468 6973 3030 7963 6332 6a6d 3a28 302c 3131 3529 005f 5f30 5f5f 5873 3030 7963 6332 6a6d
2753440  3a28 302c 3333 2900 5f5f 305f 5f58 7468 6973 3030 6163 7730 6a6d 3a72 2830 2c31 3130 2900 5f5f 305f 5f58 7330 3061 6377
2753520  306a 6d3a 2830 2c33 3329 005f 5f30 5f5f 5874 6869 7330 3071 6577 306a 6d3a 2830 2c31 3130 2900 5f5f 305f 5f58 7468 6973
2753600  3030 7974 7730 6a6d 3a72 2830 2c31 3130 2900 5f5f 305f 5f58 7330 3079 7477 306a 6d3a 2830 2c33 3329 005f 5f30 5f5f 5874
```

```
2753660 6869 7330 3071 6a77 306a 6d3a 7228 302c 3131 3029 005f 5f30 5f5f 5873 3030 716a 7730 6a6d 3a28 302c 3333 2900 5f5f 305f
2753740 5f58 7468 6973 3030 696b 6332 6a6d 3a28 302c 3131 3529 005f 5f30 5f5f 586c 696e 6530 3069 6b63 326a 6d3a 2830 2c31 2900
2754020 5f5f 305f 5f58 7468 6973 3030 796d 6332 6a6d 3a28 302c 3131 3529 005f 5f30 5f5f 586c 696e 6530 3079 6d63 326a 6d3a 2830
2754100 2c31 2900 5f5f 305f 5f58 7468 6973 3030 6970 6332 6a6d 3a28 302c 3131 3529 005f 5f30 5f5f 586c 696e 6530 3069 7063 326a
2754160 6d3a 2830 2c31 2900 5f5f 3074 6869 7320 3a5a 746c 005f 5f30 626c 6b5f 6669 6c65 5f6e 616d 6520 3a5a 746c 005f 5f31 6c65
2754240 7874 6f6b 656e 203a 5a74 6c00 5f5f 3169 645f 6973 203a 5a74 6c00 5f5f 3161 6e63 6573 746f 7220 3a5a 746c 005f 5f31 6964
2754320 5f65 7272 6f72 203a 5a74 6c00 5f5f 316c 6576 656c 203a 5a74 6c00 5f5f 3146 5479 7065 203a 5a74 6c00 5f5f 3146 5661 6c75
2754400 6520 3a5a 746c 005f 5f31 5061 7243 6c61 7373 203a 5a74 6c00 5f5f 3166 7020 3a5a 746c 005f 5f31 4f50 7472 203a 5a74 6c00
2754460 5f5f 3150 6172 4c69 7374 203a 5a74 6c00 5f5f 316c 6578 5f6d 656d 5f67 7270 203a 5a74 6c00 5f5f 305f 5f58 7468 6973 3030
2754540 7975 6379 6a6d 203a 5a74 6c00 5f5f 305f 5f58 6e30 3079 7563 796a 6d20 3a5a 746c 005f 5f30 5f5f 5874 6869 7330 3061 7561
2754620 796b 6f20 3a5a 746c 005f 5f30 5f5f 586f 3030 6175 6179 6b6f 203a 5a74 6c00 5f5f 305f 5f58 7468 6973 3030 7973 7232 6a6d
2754700 203a 5a74 6c00 5f5f 305f 5f58 7468 6973 3030 697a 7232 6a6d 203a 5a74 6c00 5f5f 305f 5f58 7468 6973 3030 7132 7232 6a6d
2754760 203a 5a74 6c00 5f5f 305f 5f58 7468 6973 3030 7935 7232 6a6d 203a 5a74 6c00 5f5f 305f 5f58 7468 6973 3030 6968 7232 6a6d
2755040 203a 5a74 6c00 5f5f 305f 5f58 7330 3069 6872 326a 6d20 3a5a 746c 005f 5f30 5f5f 5874 6869 7330 3061 6473 326a 6d20 3a5a
2755120 746c 005f 5f30 5f5f 5874 6869 7330 3069 6163 326a 6d20 3a5a 746c 005f 5f30 5f5f 5873 3030 6961 6332 6a6d 203a 5a74 6c00
2755200 5f5f 305f 5f58 7468 6973 3030 6966 6332 6a6d 203a 5a74 6c00 5f5f 305f 5f58 7330 3069 6663 326a 6d20 3a5a 746c 005f 5f30
2755260 5f5f 5874 6869 7330 3079 6363 326a 6d20 3a5a 746c 005f 5f30 5f5f 5873 3030 7963 6332 6a6d 203a 5a74 6c00 5f5f 305f 5f58
2755340 7468 6973 3030 6163 7730 6a6d 203a 5a74 6c00 5f5f 305f 5f58 7330 3061 6377 306a 6d20 3a5a 746c 005f 5f30 5f5f 5874 6869
2755420 7330 3071 6577 306a 6d20 3a5a 746c 005f 5f30 5f5f 5874 6869 7330 3079 7477 306a 6d20 3a5a 746c 005f 5f30 5f5f 5873 3030
2755500 7974 7730 6a6d 203a 5a74 6c00 5f5f 305f 5f58 7468 6973 3030 716a 7730 6a6d 203a 5a74 6c00 5f5f 305f 5f58 7330 3071 6a77
2755560 306a 6d20 3a5a 746c 005f 5f30 5f5f 5874 6869 7330 3069 6b63 326a 6d20 3a5a 746c 005f 5f30 5f5f 586c 696e 6530 3069 6b63
2755640 326a 6d20 3a5a 746c 005f 5f30 5f5f 5874 6869 7330 3079 6d63 326a 6d20 3a5a 746c 005f 5f30 5f5f 586c 696e 6530 3079 6d63
2755720 326a 6d20 3a5a 746c 005f 5f30 5f5f 5874 6869 7330 3069 7063 326a 6d20 3a5a 746c 005f 5f30 5f5f 586c 696e 6530 3069 7063
2756000 326a 6d20 3a5a 746c 0052 6561 645f 5648 444c 5f42 6c6b 4669 6c65 5f5f 3941 6c6c 426c 6f63 6b73 4650 6320 3a5a 7446 0072
2756060 6561 645f 7661 6c75 655f 5f46 6954 3150 633a 4628 302c 3229 005f 5f30 426c 6b4f 776e 6572 3a70 2830 2c31 2900 5f5f 3074
2756140 7970 653a 7028 302c 3129 005f 5f30 5661 6c75 653a 7028 302c 3333 2900 5f5f 305f 5f58 7468 6973 3030 6175 7331 626b 3a28
2756220 302c 3132 3229 005f 5f30 5f5f 5874 6869 7330 3071 7076 3062 6b3a 2830 2c31 3130 2900 5f5f 305f 5f58 7468 6973 3030 6168
2756300 347a 626b 3a28 302c 3132 3329 005f 5f30 5f5f 5874 6869 7330 3071 6a34 7a62 6b3a 2830 2c31 3233 2900 5f5f 305f 5f58 6930
2756360 3071 6a34 7a62 6b3a 2830 2c31 2900 5f5f 305f 5f58 7468 6973 3030 716e 347a 626b 3a28 302c 3132 3329 005f 5f30 5f5f 5866
2756440 3030 716e 347a 626b 3a28 302c 3929 005f 5f30 5f5f 5874 6869 7330 3071 6534 7a62 6b3a 2830 2c31 3233 2900 5f5f 3042 6c6b
2756520 4f77 6e65 7220 3a5a 746c 005f 5f30 7479 7065 203a 5a74 6c00 5f5f 3056 616c 7565 203a 5a74 6c00 5f5f 305f 5f58 7468 6973
2756600 3030 6175 7331 626b 203a 5a74 6c00 5f5f 305f 5f58 7468 6973 3030 7170 7630 626b 203a 5a74 6c00 5f5f 305f 5f58 7468 6973
2756660 3030 6168 347a 626b 203a 5a74 6c00 5f5f 305f 5f58 7468 6973 3030 716a 347a 626b 203a 5a74 6c00 5f5f 305f 5f58 6930 3071
2756740 6a34 7a62 6b20 3a5a 746c 005f 5f30 5f5f 5874 6869 7330 3071 6e34 7a62 6b20 3a5a 746c 005f 5f30 5f5f 5866 3030 716e 347a
2757020 626b 203a 5a74 6c00 5f5f 305f 5f58 7468 6973 3030 7165 347a 626b 203a 5a74 6c00 7265 6164 5f76 616c 7565 5f5f 4669 5431
2757100 5063 203a 5a74 4600 7265 6164 5f74 7970 655f 5f46 6950 633a 4628 302c 3229 005f 5f30 426c 6b4f 776e 6572 3a70 2830 2c31
2757160 2900 5f5f 3074 7970 653a 7028 302c 3333 2900 5f5f 305f 5f58 7468 6973 3030 6135 7231 626b 3a72 2830 2c31 3232 2900 5f5f
2757240 305f 5f58 7330 3061 3572 3162 6b3a 2830 2c33 3329 005f 5f30 5f5f 5874 6869 7330 3061 6877 3062 6b3a 2830 2c31 3130 2900
2757320 5f5f 3042 6c6b 4f77 6e65 7220 3a5a 746c 005f 5f30 7479 7065 203a 5a74 6c00 5f5f 305f 5f58 7468 6973 3030 6135 7231 626b
2757400 203a 5a74 6c00 5f5f 305f 5f58 7330 3061 3572 3162 6b20 3a5a 746c 005f 5f30 5f5f 5874 6869 7330 3061 6877 3062 6b20 3a5a
2757460 746c 0072 6561 645f 7479 7065 5f5f 4669 5063 203a 5a74 4600 5045 7272 6f72 5f5f 4669 5431 5063 3a46 2830 2c32 2900 5f5f
2757540 3045 7272 4e75 613a 7028 302c 3129 005f 5f30 4c69 6e65 4e75 6d3a 7028 302c 3129 005f 5f30 7465 7874 3a70 2830 2c33 3329
2757620 005f 5f30 4572 724e 756d 203a 5a74 6c00 5f5f 304c 696e 654e 756d 203a 5a74 6c00 5f5f 3074 6578 7420 3a5a 746c 0050 4572
2757700 726f 725f 5f46 6954 3150 6320 3a5a 7446 005f 5f73 7469 5f5f 416c 6c42 6c6f 636b 735f 315f 6378 785f 6c73 696e 6873 6869
2757760 645f 3a46 2830 2c32 2900 2f75 7372 2f43 432f 7375 6e34 2f69 6e63 6c2f 696f 7374 725f 616d 2e68 005f 5f73 7464 5f5f 416c
2760040 6c42 6c6f 636b 735f 315f 6378 785f 6c73 696e 6873 6869 645f 3a46 2830 2c32 2900 5f5f 7674 626c 5f5f 3136 626c 6f63 6b5f
2760120 6174 7472 6962 7574 6573 5f5f 416c 6c42 6c6f 636b 735f 315f 6378 783a 4728 302c 3132 3629 3461 7228 302c 3129 3b30 3b31
2760200 303b 2830 2c31 3529 305f 5f76 7462 6c5f 5f38 4c50 4f62 6a65 6374 5f5f 416c 6c42 6c6f 636b 735f 315f 6378 783a 4728 302c
2760260 3132 3729 3d61 7228 302c 3129 3b30 3b33 3b28 302c 3135 2900 7365 745f 4655 5f46 696c 654e 616d 655f 5f38 4669 6c65 556e
2760340 6974 4650 633a 6628 302c 3229 005f 5f30 7468 6973 3a70 2830 2c31 3238 293d 2a28 302c 3131 3729 005f 5f30 733a 7028 302c
2760420 3333 2900 2e2f 6978 782f 4669 6c65 556e 2e68 7878 005f 5f30 7468 6973 3a72 2830 2c31 3238 2900 5f5f 3074 6869 7320 3a5a
2760500 746c 005f 5f30 7320 3a5a 746c 0073 6574 5f46 555f 4669 6c65 4e61 6d65 5f5f 3846 696c 6555 6e69 7446 5063 203a 5a74 4600
2760560 6578 706c 6169 6e5f 5f31 3662 6c6f 636b 5f61 7474 7269 6275 7465 7346 5063 3a66 2830 2c32 2900 5f5f 3074 6869 733a 7028
2760640 302c 3132 3229 005f 5f30 733a 7028 302c 3333 2900 2e2f 6878 782f 6174 7472 6962 7574 652e 6878 7800 5f5f 3074 6869 733a
2760720 7228 302c 3132 3229 005f 5f30 7468 6973 203a 5a74 6c00 5f5f 3073 203a 5a74 6c00 6578 706c 6169 6e5f 5f31 3662 6c6f 636b
```

```
2761000 5f61 7474 7269 6275 7465 7346 5063 203a 5a74 4600 7365 745f 7061 7261 6d65 7465 725f 7661 6c75 655f 7479 7065 5f5f 3970
2761060 6172 616d 6574 6572 4650 633a 6628 302c 3229 005f 5f30 7468 6973 3a70 2830 2c31 3130 2900 5f5f 3073 3a70 2830 2c33 3329
2761140 002e 2f68 7878 2f70 6172 616d 6574 6572 2e68 7878 005f 5f30 7468 6973 3a72 2830 2c31 3130 2900 5f5f 3074 6869 7320 3a5a
2761220 746c 005f 5f30 7320 3a5a 746c 0073 6574 5f70 6172 616d 6574 6572 5f76 616c 7565 5f74 7970 655f 5f39 7061 7261 6d65 7465
2761300 7246 5063 203a 5a74 4600 6578 706c 6169 6e5f 5f38 4c50 4f62 6a65 6374 4650 633a 6628 302c 3229 005f 5f30 7468 6973 3a70
2761360 2830 2c31 3235 2900 5f5f 3073 3a70 2830 2c33 3329 002f 686f 6d65 2f6f 7361 7331 2f61 2f61 622f 7372 632f 6e65 776f 626a
2761440 6563 7473 2f68 7878 2f4c 504f 626a 6563 745f 6462 2e68 7878 005f 5f30 7468 6973 3a72 2830 2c31 3235 2900 5f5f 3074 6869
2761520 7320 3a5a 746c 005f 5f30 7320 3a5a 746c 0065 7870 6c61 696e 5f5f 384c 504f 626a 6563 7446 5063 203a 5a74 4600 6973 4c54
2761600 455f 5f37 4e4f 626a 6563 7446 5036 4f62 6a65 6374 3a66 2830 2c31 2900 5f5f 3074 6869 733a 7028 302c 3939 2900 5f5f 305f
2761660 5f41 3431 3a70 2830 2c31 3239 293d 2a28 302c 3932 2900 2f68 6f6d 652f 6f73 6173 312f 612f 6162 2f73 7263 2f6e 6577 6f62
2761740 6a65 6374 732f 6878 782f 4e4f 626a 6563 745f 6462 2e68 7878 005f 5f30 7468 6973 203a 5a74 6c00 5f5f 305f 5f41 3431 203a
2762020 5a74 6c00 6973 4c54 455f 5f37 4e4f 626a 6563 7446 5036 4f62 6a65 6374 203a 5a74 4600 6973 4754 455f 5f37 4e4f 626a 6563
2762100 7446 5036 4f62 6a65 6374 3a66 2830 2c31 2900 5f5f 3074 6869 733a 7028 302c 3939 2900 5f5f 305f 5f41 3430 3a70 2830 2c31
2762160 3239 2900 5f5f 3074 6869 7320 3a5a 746c 005f 5f30 5f5f 4134 3020 3a5a 746c 0069 7347 5445 5f5f 374e 4f62 6a65 6374 4650
2762240 364f 626a 6563 7420 3a5a 7446 0073 6574 5072 6f70 5f5f 374e 4f62 6a65 6374 4650 6366 3a66 2830 2c32 2900 5f5f 3074 6869
2762320 733a 7028 302c 3939 2900 5f5f 315f 5f41 3338 3a70 2830 2c33 3329 005f 5f31 5f5f 4133 393a 7028 302c 3130 2900 5f5f 3074
2762400 6869 7320 3a5a 746c 005f 5f31 5f5f 4133 3820 3a5a 746c 005f 5f31 5f5f 4133 3920 3a5a 746c 0073 6574 5072 6f70 5f5f 374e
2762460 4f62 6a65 6374 4650 6366 203a 5a74 4600 7365 7450 726f 705f 5f37 4e4f 626a 6563 7446 5063 693a 6628 302c 3229 005f 5f30
2762540 7468 6973 3a70 2830 2c39 3929 005f 5f31 5f5f 4133 363a 7028 302c 3333 2900 5f5f 315f 5f41 3337 3a70 2830 2c31 2900 5f5f
2762620 3074 6869 7320 3a5a 746c 005f 5f31 5f5f 4133 3620 3a5a 746c 005f 5f31 5f5f 4133 3720 3a5a 746c 0073 6574 5072 6f70 5f5f
2762700 374e 4f62 6a65 6374 4650 6369 203a 5a74 4600 7365 7450 726f 705f 5f37 4e4f 626a 6563 7446 5063 5431 3a66 2830 2c32 2900
2762760 5f5f 3074 6869 733a 7028 302c 3939 2900 5f5f 315f 5f41 3334 3a70 2830 2c33 3329 005f 5f31 5f5f 4133 353a 7028 302c 3333
2763040 2900 5f5f 3074 6869 7320 3a5a 746c 005f 5f31 5f5f 4133 3420 3a5a 746c 005f 5f31 5f5f 4133 3520 3a5a 746c 0073 6574 5072
2763120 6f70 5f5f 374e 4f62 6a65 6374 4650 6354 3120 3a5a 7446 0067 6574 5072 6f70 5f5f 374e 4f62 6a65 6374 4650 6369 3a66 2830
2763200 2c33 3329 005f 5f30 7468 6973 3a70 2830 2c39 3929 005f 5f30 5f5f 4133 323a 7028 302c 3333 2900 5f5f 305f 5f41 3333 3a70
2763260 2830 2c31 2900 5f5f 3074 6869 7320 3a5a 746c 005f 5f30 5f5f 4133 3220 3a5a 746c 005f 5f30 5f5f 4133 3320 3a5a 746c 0067
2763340 6574 5072 6f70 5f5f 374e 4f62 6a65 6374 4650 6369 203a 5a74 4600 6765 7441 7474 725f 5f37 4e4f 626a 6563 7446 693a 6628
2763420 302c 3333 2900 5f5f 3074 6869 733a 7028 302c 3939 2900 5f5f 305f 5f41 3331 3a70 2830 2c31 2900 5f5f 3074 6869 7320 3a5a
2763500 746c 005f 5f30 5f5f 4133 3120 3a5a 746c 0067 6574 4174 7472 5f5f 374e 4f62 6a65 6374 4669 203a 5a74 4600 696e 4f72 6465
2763560 725f 5f36 4f62 6a65 6374 4650 364f 626a 6563 743a 6628 302c 3129 005f 5f30 7468 6973 3a70 2830 2c31 3239 2900 5f5f 305f
2763640 5f41 3239 3a70 2830 2c31 3239 2900 2f68 6f6d 652f 6f73 6173 312f 612f 6162 2f73 7263 2f6e 6577 6f62 6a65 6374 732f 6878
2763720 782f 4f62 6a65 6374 5f64 622e 6878 7800 5f5f 3074 6869 7320 3a5a 746c 005f 5f30 5f5f 4132 3920 3a5a 746c 0069 6e4f 7264
2764000 6572 5f5f 364f 626a 6563 7446 5036 4f62 6a65 6374 203a 5a74 4600 6d61 696e 5f76 6578 2e6f 005f 7365 745f 7061 7261 6d65
2764060 7465 725f 7661 6c75 655f 7479 7065 5f5f 3970 6172 616d 6574 6572 4650 6300 5f73 6574 5072 6f70 5f5f 374e 4f62 6a65 6374
2764140 4650 6366 005f 7365 7450 726f 705f 5f37 4e4f 626a 6563 7446 5063 6900 5f65 7870 6c61 696e 5f5f 3136 626c 6f63 6b5f 6174
2764220 7472 6962 7574 6573 4650 6300 5f67 6574 4174 7472 5f5f 374e 4f62 6a65 6374 4669 005f 7365 745f 4655 5f46 696c 654e 616d
2764300 655f 5f38 4669 6c65 556e 6974 4650 6300 5f70 7574 5f5f 376f 7374 7265 616d 4663 005f 7365 7450 726f 705f 5f37 4e4f 626a
2764360 6563 7446 5063 5431 005f 5265 6164 4f70 7469 6f6e 735f 5f46 6950 5063 005f 696f 7374 7265 616d 5f69 6e69 7400 5f69 734c
2764440 5445 5f5f 374e 4f62 6a65 6374 4650 364f 626a 6563 7400 5f69 7347 5445 5f5f 374e 4f62 6a65 6374 4650 364f 626a 6563 7400
2764520 5f65 7870 6c61 696e 5f5f 384c 504f 626a 6563 7446 5063 005f 5f5f 6374 5f5f 3941 6c6c 426c 6f63 6b73 4676 005f 6765 7450
2764600 726f 705f 5f37 4e4f 626a 6563 7446 5063 6900 5f5f 5f63 745f 5f36 656e 7469 7479 4676 005f 696e 4f72 6465 725f 5f36 4f62
2764660 6a65 6374 4650 364f 626a 6563 7400 5f42 6c6b 4669 6c65 002f 686f 6d65 2f6f 7361 7331 2f61 2f61 622f 7372 632f 6e65 776f
2764740 626a 6563 7473 2f70 726f 672f 432b 2b2e 3233 3239 352f 006d 6169 6e5f 7665 782e 6300 6d61 696e 5f76 6578 2e63 7878 0069
2765020 6e74 3a74 2830 2c31 293d 7228 302c 3129 3b2d 3231 3437 3438 3336 3438 3b32 3134 3734 3833 3634 373b 0063 6861 723a 7428
2765100 302c 3229 3d72 2830 2c32 293b 303b 3132 373b 006c 6f6e 673a 7428 302c 3329 3d72 2830 2c31 293b 2d32 3134 3734 3833 3634
2765160 383b 3231 3437 3430 3336 3437 3b00 7368 6f72 743a 7428 302c 3429 3d72 2830 2c31 293b 2d33 3237 3638 3b33 3237 3637 3b00
2765240 756e 7369 676e 6564 2063 6861 723a 7428 302c 3529 3d72 2830 2c31 293b 303b 3235 353b 0075 6e73 6967 6e65 6420 7368 6f72
2765320 743a 7428 302c 3629 3d72 2830 2c31 293b 303b 3635 3533 353b 0075 6e73 6967 6e65 6420 6c6f 6e67 3a74 2830 2c37 293d 7228
2765400 302c 3129 3b30 3b2d 313b 0075 6e73 6967 6e65 6420 696e 743a 7428 302c 3829 3d72 2830 2c31 293b 303b 2d31 3b00 666c 6f61
2765460 743a 7428 302c 3929 3d72 2830 2c31 293b 343b 303b 0064 6f75 626c 653a 7428 302c 3130 293d 7228 302c 3129 3b38 3b30 3b00
2765540 766f 6964 3a74 2830 2c31 3129 3d28 302c 3131 2900 3f3f 3f3a 7428 302c 3132 293d 2830 2c31 2900 5f5f 7670 7470 3a74 2830
2765620 2c31 3329 3d2a 2830 2c31 3429 3d66 2830 2c31 2900 5f5f 6d70 7472 3a54 2830 2c31 3529 3d73 3864 3a28 302c 3429 2c30 2c31
2765700 363b 693a 2830 2c34 292c 3136 2c31 363b 663a 2830 2c31 3329 2c33 322c 3332 3b3b 005f 5046 565f 3a74 2830 2c31 3629 3d2a
2765760 2830 2c31 3729 3d66 2830 2c32 2900 5f50 4649 5f3a 7428 302c 3133 2900 6572 726e 6f3a 4728 302c 3129 0073 7973 5f6e 6572
2766040 723a 4728 302c 3129 0065 6e76 6972 6f6e 3a47 2830 2c31 3929 3d2a 2830 2c32 3029 3d2a 2830 2c32 2900 656e 643a 4728 302c
```

```
2766120 3129 0065 7465 7874 3a47 2830 2c31 2900 6564 6174 613a 4728 302c 3129 006f 7074 6172 673a 4728 302c 3230 2900 6f70 7469
2766200 6e64 3a47 2830 2c31 2900 6f70 7465 7272 3a47 2830 2c31 2900 7074 7264 6966 665f 743a 7428 302c 3129 0073 697a 655f 743a
2766260 7428 302c 3829 0073 7472 6561 6170 6f73 3a74 2830 2c31 2900 7374 7265 616d 6f66 663a 7428 302c 3129 0069 6f5f 7374 6174
2766340 653a 5428 302c 3231 293d 6567 6f6f 6462 6974 5f5f 696f 5f73 7461 7465 3a30 2c65 6f66 6269 745f 5f69 6f5f 7374 6174 653a
2766420 312c 6661 696c 6269 745f 5f69 6f5f 7374 6174 653a 322c 6261 6462 6974 5f5f 696f 5f73 7461 7465 3a33 2c68 6172 6466 6169
2766500 6c5f 5f69 6f5f 7374 6174 653a 342c 3b00 6f70 656e 5f6d 6f64 653a 5428 302c 3232 293d 6569 6e5f 5f6f 7065 6e5f 6d6f 6465
2766560 3a30 2c6f 7574 5f5f 6f70 656e 5f6d 6f64 653a 312c 6174 655f 5f6f 7065 6e5f 6d6f 6465 3a32 2c61 7070 5f5f 6f70 656e 5f6d
2766640 6f64 653a 332c 7472 756e 635f 5f6f 7065 6e5f 6d6f 6465 3a34 2c6e 6f63 7265 6174 655f 5f6f 7065 6e5f 6d6f 6465 3a35 2c6e
2766720 6f72 6570 6c61 6365 5f5f 6f70 656e 5f6d 6f64 653a 362c 3b00 7365 656b 5f64 6972 3a54 2830 2c32 3329 3d65 6265 675f 5f73
2767000 6565 6b5f 6469 723a 302c 6375 725f 5f73 6565 6b5f 6469 723a 312c 656e 645f 5f73 6565 6b5f 6469 723a 322c 3b00 5f5f 4531
2767060 3a54 2830 2c32 3429 3d65 736b 6970 7773 5f5f 5f5f 4531 3a30 2c6c 6566 745f 5f5f 5f45 313a 312c 7269 6768 745f 5f5f 5f45
2767140 313a 322c 696e 7465 726e 616c 5f5f 5f5f 4531 3a33 2c64 6563 5f5f 5f5f 4531 3a34 2c6f 6374 5f5f 5f5f 4531 3a35 2c68 6578
2767220 5f5f 5f5f 4531 3a36 2c73 686f 7762 6173 655f 5f5f 5f45 313a 372c 5c00 7368 6f77 706f 696e 745f 5f5f 5f45 313a 382c 7570
2767300 7065 7263 6173 655f 5f5f 5f45 313a 392c 7368 6f77 706f 735f 5f5f 5f45 313a 3130 2c73 6369 656e 7469 6669 635f 5f5f 5f45
2767360 313a 3131 2c66 6978 6564 5f5f 5f5f 4531 3a31 322c 756e 6974 6275 665f 5f5f 5f45 313a 3133 2c73 7464 696f 5f5f 5f5f 4531
2767440 3a31 342c 3b00 5f5f 4532 3a54 2830 2c32 3529 3d65 736b 6970 7069 6e67 5f5f 5f5f 4532 3a30 2c74 6965 645f 5f5f 5f45 323a
2767520 312c 3b00 696f 733a 5428 302c 3236 293d 7336 396e 7573 6572 5f5f 3369 6f73 3a28 302c 3129 2c30 2c33 323b 785f 7573 6572
2767600 5f5f 3369 6f73 3a28 302c 3330 293d 2a28 302c 3237 293d 7875 696f 735f 7573 6572 5f75 6e69 6f6e 3a2c 3332 2c33 323b 6270
2767660 5f5f 3369 6f73 3a28 302c 3331 293d 2a28 302c 3238 293d 7873 7374 7265 616d 6275 663a 2c36 342c 3332 3b73 7461 7465 5f5f
2767740 3369 6f73 3a28 302c 3129 2c39 362c 3332 3b69 7370 6563 6961 6c5f 5f33 696f 733a 2830 2c31 292c 3132 382c 3332 3b6f 7370
2770020 6563 6961 6c5f 5f33 696f 733a 2830 2c31 292c 3136 302c 3332 3b69 7366 785f 7370 6563 6961 6c5f 5f33 696f 733a 2830 2c31
2770100 292c 3139 322c 3332 3b6f 7366 785f 7370 6563 6961 6c5f 5f33 696f 733a 2830 2c31 292c 3232 342c 3332 3b5c 0064 656c 6275
2770160 665f 5f33 696f 733a 2830 2c31 292c 3235 362c 3332 3b78 5f74 6965 5f5f 3369 6f73 3a28 302c 3332 293d 2a28 302c 3239 293d
2770240 7873 6f73 7472 6561 6d3a 2c32 3838 2c33 323b 785f 666c 6167 735f 5f33 696f 733a 2830 2c31 292c 3332 302c 3332 3b78 5f70
2770320 7265 6369 7369 6f6e 5f5f 3369 6f73 3a28 302c 3429 2c33 3532 2c31 363b 785f 6669 6c6c 5f5f 3369 6f73 3a28 302c 3229 2c33
2770400 3638 2c38 3b78 5f77 6964 7468 5f5f 3369 6f73 3a28 302c 3429 2c33 3834 2c31 363b 6173 7369 676e 5f70 7269 7661 7465 5f5f
2770460 3369 6f73 3a28 302c 3129 2c34 3136 2c33 323b 5f5f 7670 7472 5f5f 3369 6f73 3a28 302c 3333 293d 2a28 302c 3135 292c 3434
2770540 382c 3332 3b3b 0062 6173 6566 6965 6c64 5f5f 3369 6f73 3a47 2830 2c31 2900 6164 6a75 7374 6669 656c 645f 5f33 696f 733a
2770620 4728 302c 3129 0066 6c6f 6174 6669 656c 645f 5f33 696f 733a 4728 302c 3129 006e 6578 7462 6974 5f5f 3369 6f73 3a47 2830
2770700 2c31 2900 6e65 7874 776f 7264 5f5f 3369 6f73 3a47 2830 2c31 2900 7374 6469 6f66 6c75 7368 5f5f 3369 6f73 3a47 2830 2c31
2770760 3629 0069 6f73 3a5a 6369 6f73 3b3b 5f5f 6374 5f5f 3369 6f73 4650 3973 7472 6561 6d62 7566 205f 5f63 745f 5f33 696f 7346
2771040 7620 5f5f 6374 5f5f 3369 6f73 4652 3369 6f73 205f 5f64 745f 5f33 696f 7346 7620 666c 6167 735f 5f33 696f 7346 7620 666c
2771120 6167 735f 5f33 696f 7346 6c20 7365 7466 5f5f 3369 6f73 466c 5431 2073 6574 665f 5f33 696f 7346 6c20 756e 7365 7466 5f5f
2771200 3369 6f73 466c 2077 6964 7468 5f5f 3369 6f73 4676 2077 6964 7468 5f5f 3369 6f73 4669 2074 6965 5f5f 3369 6f73 4650 376f
2771260 7374 7265 616d 205c 0074 6965 5f5f 3369 6f73 4676 2066 696c 6c5f 5f33 696f 7346 6320 6669 6c6c 5f5f 3369 6f73 4676 2070
2771340 7265 6369 7369 6f6e 5f5f 3369 6f73 4669 2070 7265 6369 7369 6f6e 5f5f 3369 6f73 4676 2072 6473 7461 7465 5f5f 3369 6f73
2771420 4676 205f 5f6f 7050 765f 5f33 696f 7346 7620 5f5f 6e74 5f5f 3369 6f73 4676 2065 6f66 5f5f 3369 6f73 4676 2066 6169 6c5f
2771500 5f33 696f 7346 7620 6261 645f 5f33 696f 7346 7620 676f 6f64 5f5f 3369 6f73 4676 2063 6c65 6172 5f5f 3369 6f73 4669 2072
2771560 6462 7566 5f5f 3369 6f73 4676 205c 0069 776f 7264 5f5f 3369 6f73 4669 2070 776f 7264 5f5f 3369 6f73 4669 2062 6974 616c
2771640 6c6f 635f 5f33 696f 7353 4676 2078 616c 6c6f 635f 5f33 696f 7353 4676 2075 7265 7369 7a65 5f5f 3369 6f73 4669 2073 796e
2771720 635f 7769 7468 5f73 7464 696f 5f5f 3369 6f73 5346 7620 7365 7473 7461 7465 5f5f 3369 6f73 4669 2069 6e69 745f 5f33 696f
2772000 7346 5039 7374 7265 616d 6275 6620 5f5f 6173 5f5f 3369 6f73 4652 3369 6f73 2073 6b69 705f 5f33 696f 7346 6920 3b62 6173
2772060 6566 6965 6c64 5f5f 3369 6f73 205c 0061 646a 7573 7466 6965 6c64 5f5f 3369 6f73 2066 6c6f 6174 6669 656c 645f 5f33 696f
2772140 7320 6e65 7874 6269 745f 5f33 696f 7320 6e65 7874 776f 7264 5f5f 3369 6f73 2073 7464 696f 666c 7573 685f 5f33 696f 7320
2772220 3b3b 0073 7472 6561 6d62 7566 3a54 2830 2c32 3829 3173 3430 616c 6c6f 635f 5f39 7374 7265 616d 6275 663a 2830 2c34 292c
2772300 302c 3136 3b78 5f75 6e62 7566 5f5f 3973 7472 6561 6d62 7566 3a28 302c 3429 2c31 362c 3136 3b78 5f62 6173 655f 5f39 7374
2772360 7265 616d 6275 663a 2830 2c32 3029 2c33 322c 3332 3b78 5f70 6261 7365 5f5f 3973 7472 6561 6d62 7566 3a28 302c 3230 292c
2772440 3634 2c33 323b 785f 7070 7472 5f5f 3973 7472 6561 6d62 7566 3a28 302c 3230 292c 3936 2c33 323b 785f 6570 7074 725f 5f39
2772520 7374 7265 616d 6275 663a 2830 2c32 3029 2c31 3238 2c33 323b 785f 6770 7472 5f5f 3973 7472 6561 6d62 7566 3a28 302c 3230
2772600 292c 3136 302c 3332 3b78 5f65 6770 7472 5f5f 3973 7472 6561 6d62 7566 3a28 302c 3230 292c 3139 322c 3332 3b5c 0078 5f65
2772660 6261 636b 5f5f 3973 7472 6561 6d62 7566 3a28 302c 3230 292c 3232 342c 3332 3b78 5f62 6c65 6e5f 5f39 7374 7265 616d 6275
2772740 663a 2830 2c31 292c 3235 362c 3332 3b5f 5f76 7074 725f 5f39 7374 7265 616d 6275 663a 2830 2c33 3329 2c32 3838 2c33 323b
2773020 3b00 7374 7265 616d 6275 663a 5a63 7374 7265 616d 6275 663b 3b5f 5f63 745f 5f39 7374 7265 616d 6275 6646 5239 7374 7265
2773100 616d 6275 6620 5f5f 6374 5f5f 3973 7472 6561 6d62 7566 4676 205f 5f63 745f 5f39 7374 7265 616d 6275 6646 5363 6920 5f5f
2773160 6374 5f5f 3973 7472 6561 6d62 7566 4650 6369 5432 205f 5f61 735f 5f39 7374 7265 616d 6275 6646 5239 7374 7265 616d 6275
```

```
2773240 6620 6462 705f 5f39 7374 7265 616d 6275 6646 7620 6261 7365 5f5f 3973 7472 6561 6d62 7566 4676 2070 6261 7365 5f5f 3973
2773320 7472 6561 6d62 7566 4676 205c 0070 7074 725f 5f39 7374 7265 616d 6275 6646 7620 6570 7074 725f 5f39 7374 7265 616d 6275
2773400 6646 7620 6770 7472 5f5f 3973 7472 6561 6d62 7566 4676 2065 6770 7472 5f5f 3973 7472 6561 6d62 7566 4676 2065 6261 636b
2773460 5f5f 3973 7472 6561 6d62 7566 4676 2065 6275 665f 5f39 7374 7265 616d 6275 6646 7620 626c 656e 5f5f 3973 7472 6561 6d62
2773540 7566 4676 2073 6574 705f 5f39 7374 7265 616d 6275 6646 5063 5431 2073 6574 675f 5f39 7374 7265 616d 6275 6646 5063 4e32
2773620 3120 7062 756d 735f 5f39 7374 7265 616d 6275 6646 6920 5c00 6762 756d 705f 5f39 7374 7265 616d 6275 6646 6920 7365 7462
2773700 5f5f 3973 7472 6561 6d62 7566 4650 6354 3169 2075 6e62 7566 6665 7265 645f 5f39 7374 7265 616d 6275 6646 7620 756e 6275
2773760 6666 6572 6564 5f5f 3973 7472 6561 6d62 7566 4669 2061 6c6c 6f63 6174 655f 5f39 7374 7265 616d 6275 6646 7620 646f 616c
2774040 6c6f 6361 7465 5f5f 3973 7472 6561 6d62 7566 4676 206f 7665 7266 6c6f 775f 5f39 7374 7265 616d 6275 6646 6920 756e 6465
2774120 7266 6c6f 775f 5f39 7374 7265 616d 6275 6646 7620 5c00 7062 6163 6b66 6169 6c5f 5f39 7374 7265 616d 6275 6646 6920 7379
2774200 6e63 5f5f 3973 7472 6561 6d62 7566 4676 2073 6565 6b6f 6666 5f5f 3973 7472 6561 6d62 7566 466c 3873 6565 6b5f 6469 7269
2774260 2073 6565 6b70 6f73 5f5f 3973 7472 6561 6d62 7566 466c 6920 7873 7075 746e 5f5f 3973 7472 6561 6d62 7566 4650 4363 6920
2774340 7873 6765 746e 5f5f 3973 7472 6561 6d62 7566 4650 6369 2069 6e5f 6176 6169 6c5f 5f39 7374 7265 616d 6275 6646 7620 6f75
2774420 745f 7761 6974 696e 675f 5f39 7374 7265 616d 6275 6646 7620 5c00 7367 6574 635f 5f39 7374 7265 616d 6275 6646 7620 736e
2774500 6578 7463 5f5f 3973 7472 6561 6d62 7566 4676 2073 6275 6d70 635f 5f39 7374 7265 616d 6275 6646 7620 7374 6f73 7363 5f5f
2774560 3973 7472 6561 6d62 7566 4676 2073 7075 7462 6163 6b63 5f5f 3973 7472 6561 6d62 7566 4663 2073 7075 7463 5f5f 3973 7472
2774640 6561 6d62 7566 4669 2073 7075 746e 5f5f 3973 7472 6561 6d62 7566 4650 4363 6920 7367 6574 6e5f 5f39 7374 7265 616d 6275
2774720 6646 5063 6920 7365 7462 7566 5f5f 3973 7472 6561 6d62 7566 4650 6369 205c 0073 6574 6275 665f 5f39 7374 7265 616d 6275
2775000 6646 5055 6369 2073 6574 6275 665f 5f39 7374 7265 616d 6275 6646 5063 6954 3220 5f5f 6474 5f5f 3973 7472 6561 6d62 7566
2775060 4676 2078 5f73 6e65 7874 635f 5f39 7374 7265 616d 6275 6646 7620 3b3b 3b00 6973 7472 6561 6d3a 5428 302c 3334 293d 7337
2775140 3278 5f67 636f 756e 745f 5f37 6973 7472 6561 6d3a 2830 2c31 292c 302c 3332 3b5f 5f76 7074 725f 5f37 6973 7472 6561 6d3a
2775220 2830 2c33 3329 2c33 322c 3332 3b50 696f 733a 2830 2c33 3529 3d2a 2830 2c32 3629 2c36 342c 3332 3b4f 696f 733a 2830 2c32
2775300 3629 2c39 362c 3438 303b 3b00 6973 7472 6561 6d3a 5a63 6973 7472 6561 6d3b 696f 733b 5f5f 6374 5f5f 3769 7374 7265 616d
2775360 4650 3973 7472 6561 6d62 7566 205f 5f63 745f 5f37 6973 7472 6561 6d46 7620 5f5f 6374 5f5f 3769 7374 7265 616d 4650 3973
2775440 7472 6561 6d62 7566 6950 376f 7374 7265 616d 205f 5f63 745f 5f37 6973 7472 6561 6d46 6950 6354 3120 5f5f 6374 5f5f 3769
2775520 7374 7265 616d 4669 5431 5037 6f73 7472 6561 6420 5f5f 6374 5f5f 3769 7374 7265 616d 4652 3769 7374 7265 616d 205f 5f64
2775600 745f 5f37 6973 7472 6561 6d46 7620 5c00 6970 6678 5f5f 3769 7374 7265 616d 4669 2069 7366 785f 5f37 6973 7472 6561 6d46
2775660 7620 7365 656b 675f 5f37 6973 7472 6561 6d46 6c20 7365 656b 675f 5f37 6973 7472 6561 6d46 6c38 7365 656b 5f64 6972 2074
2775740 656c 6c67 5f5f 3769 7374 7265 616d 4676 205f 5f72 735f 5f37 6973 7472 6561 6d46 5046 5237 6973 7472 6561 6d5f 5237 6973
2776020 7472 6561 6d20 5f5f 7273 5f5f 3769 7374 7265 616d 4650 4652 3369 6f73 5f52 3369 6f73 205f 5f72 735f 5f37 6973 7472 6561
2776100 6d46 5063 205f 5f72 735f 5f37 6973 7472 6561 6d46 5055 6320 5c00 5f5f 7273 5f5f 3769 7374 7265 616d 4652 5563 205f 5f72
2776160 735f 5f37 6973 7472 6561 6d46 5263 205f 5f72 735f 5f37 6973 7472 6561 6d46 5273 205f 5f72 735f 5f37 6973 7472 6561 6d46
2776240 5269 205f 5f72 735f 5f37 6973 7472 6561 6d46 526c 205f 5f72 735f 5f37 6973 7472 6561 6d46 5255 7320 5f5f 7273 5f5f 3769
2776320 7374 7265 616d 4652 5569 205f 5f72 735f 5f37 6973 7472 6561 6d46 5255 6c20 5f5f 7273 5f5f 3769 7374 7265 616d 4652 6620
2776400 5f5f 7273 5f5f 3769 7374 7265 616d 4652 6420 5f5f 7273 5f5f 3769 7374 7265 616d 4650 3973 7472 6561 6d62 7566 205c 0067
2776460 6574 5f5f 3769 7374 7265 616d 4650 6369 6320 6765 745f 5f37 6973 7472 6561 6d46 5055 6369 6320 6765 745f 5f37 6973 7472
2776540 6561 6d46 5239 7374 7265 616d 6275 6663 2067 6574 5f5f 3769 7374 7265 616d 4652 5563 2067 6574 5f5f 3769 7374 7265 616d
2776620 4652 6320 6765 745f 5f37 6973 7472 6561 6d46 7620 6765 746c 696e 655f 5f37 6973 7472 6561 6d46 5063 6963 2067 6574 6c69
2776700 6e65 5f5f 3769 7374 7265 616d 4650 5563 6963 2070 6565 6b5f 5f37 6973 7472 6561 6d46 7620 6967 6e6f 7265 5f5f 3769 7374
2776760 7265 616d 4669 5431 205c 0072 6561 645f 5f37 6973 7472 6561 6d46 5063 6920 7265 6164 5f5f 3769 7374 7265 616d 4650 5563
2777040 6920 6763 6f75 6e74 5f5f 3769 7374 7265 616d 4676 2070 7574 6261 636b 5f5f 3769 7374 7265 616d 4663 2073 796e 635f 5f37
2777120 6973 7472 6561 6d46 7620 646f 5f69 7066 785f 5f37 6973 7472 6561 6d46 6920 6561 7477 6869 7465 5f5f 3769 7374 7265 616d
2777200 4676 2078 6765 745f 5f37 6973 7472 6561 6d46 5063 203b 3b3b 006f 7374 7265 616d 3a54 2830 2c32 3929 3d73 3638 5f5f 7670
2777260 7472 5f5f 376f 7374 7265 616d 3a28 302c 3333 292c 302c 3332 3b50 696f 733a 2830 2c33 3529 2c33 322c 3332 3b4f 696f 733a
2777340 2830 2c32 3629 2c36 342c 3438 303b 3b00 6f73 7472 6561 6d3a 5a63 6f73 7472 6561 6d3b 696f 733b 5f5f 6374 5f5f 376f 7374
2777420 7265 616d 4650 3973 7472 6561 6d62 7566 205f 5f63 745f 5f37 6f73 7472 6561 6d46 7620 5f5f 6374 5f5f 376f 7374 7265 616d
2777500 4669 205f 5f63 745f 5f37 6f73 7472 6561 6d46 6950 6320 5f5f 6374 5f5f 376f 7374 7265 616d 4652 376f 7374 7265 616d 205f
2777560 5f64 745f 5f37 6f73 7472 6561 6d46 7620 6f70 6678 5f5f 376f 7374 7265 616d 4676 206f 7366 785f 5f37 6f73 7472 6561 6d46
2777640 7620 666c 7573 685f 5f37 6f73 7472 6561 6d46 7620 5c00 7365 656b 705f 5f37 6f73 7472 6561 6d46 6c20 7365 656b 705f 5f37
2777720 6f73 7472 6561 6d46 6c38 7365 656b 5f64 6972 2074 656c 6c70 5f5f 376f 7374 7265 616d 4676 2070 7574 5f5f 376f 7374 7265
3000000 616d 4663 205f 5f6c 735f 5f37 6f73 7472 6561 6d46 6320 5f5f 6c73 5f5f 376f 7374 7265 616d 4655 6320 5f5f 6c73 5f5f 376f
3000060 7374 7265 616d 4650 4363 205f 5f6c 735f 5f37 6f73 7472 6561 6d46 6920 5f5f 6c73 5f5f 376f 7374 7265 616d 466c 205f 5f6c
3000140 735f 5f37 6f73 7472 6561 6d46 6420 5f5f 6c73 5f5f 376f 7374 7265 616d 4666 205c 005f 5f6c 735f 5f37 6f73 7472 6561 6d46
3000220 5569 205f 5f6c 735f 5f37 6f73 7472 6561 6d46 556c 205f 5f6c 735f 5f37 6f73 7472 6561 6d46 5076 205f 5f6c 735f 5f37 6f73
3000300 7472 6561 6d46 5039 7374 7265 616d 6275 6620 5f5f 6c73 5f5f 376f 7374 7265 616d 4673 205f 5f6c 735f 5f37 6f73 7472 6561
```

```
3000360 6d46 5573 205f 5f6c 735f 5f37 6f73 7472 6561 6346 5046 5237 6f73 7472 6561 6d5f 5237 6f73 7472 6561 6d20 5f5f 6c73 5f5f
3000440 376f 7374 7265 616d 4650 4652 3369 6f73 5f52 3369 6f73 2077 7269 7465 5f5f 376f 7374 7265 616d 4650 4363 6920 5c00 7772
3000520 6974 655f 5f37 6f73 7472 6561 6d46 5043 5563 6920 646f 5f6f 7066 785f 5f37 6f73 7472 6561 6d46 7620 646f 5f6f 7366 785f
3000600 5f37 6f73 7472 6561 6d46 7620 3b3b 3b00 7075 745f 5f37 6f73 7472 6561 6d46 633a 6628 302c 3336 293d 2a28 302c 3239 2900
3000660 5f5f 3074 6869 733a 7028 302c 3336 2900 5f5f 3063 3a70 2830 2c32 2900 2f75 7372 2f43 432f 7375 6e34 2f69 6e63 6c2f 696f
3000740 7374 7265 616d 2e68 005f 5f30 7468 6973 3a72 2830 2c33 3629 005f 5f30 7468 6973 203a 5a74 6c00 5f5f 3063 203a 5a74 6c00
3001020 7075 745f 5f37 6f73 7472 6561 6d46 6320 3a5a 7446 0069 6f73 7472 6561 6d3a 5428 302c 3337 293d 7338 3078 5f67 636f 756e
3001100 745f 5f37 6973 7472 6561 6d3a 2830 2c31 292c 302c 3332 3b5f 5f76 7074 725f 5f37 6973 7472 6561 6d3a 2830 2c33 3329 2c33
3001160 322c 3332 3b50 696f 733a 2830 2c33 3529 2c36 342c 3332 3b4f 6f73 7472 6561 6d3a 2830 2c32 3929 2c39 362c 3534 343b 3b00
3001240 696f 7374 7265 616d 3a5a 6369 6f73 7472 6561 6d3b 6973 7472 6561 6d20 6f73 7472 6561 6d20 696f 733b 5f5f 6374 5f5f 3869
3001320 6f73 7472 6561 6d46 5039 7374 7265 616d 6275 6620 5f5f 6374 5f5f 3869 6f73 7472 6561 6d46 7620 5f5f 6374 5f5f 3869 6f73
3001400 7472 6561 6d46 5238 696f 7374 7265 616d 205f 5f64 745f 5f38 696f 7374 7265 616d 4676 203b 3b3b 0063 696e 3a47 2830 2c33
3001460 3829 3d78 7369 7374 7265 616d 5f77 6974 6861 7373 6967 6e3a 0063 6f75 743a 4728 302c 3339 293d 7873 6f73 7472 6561 6d5f
3001540 7769 7468 6173 7369 676e 3a00 6365 7272 3a47 2830 2c33 3929 0063 6c6f 673a 4728 302c 3339 2900 496f 7374 7265 616d 5f69
3001620 6e69 743a 5428 302c 3430 293d 7331 5f5f 5739 5f5f 3133 496f 7374 7265 616d 5f69 6e69 743a 2930 2c32 292c 302c 383b 3b00
3001700 7374 6473 7461 7475 735f 5f31 3349 6f73 7472 6561 6d5f 696e 6974 3a47 2830 2c31 2900 696e 6974 636f 756e 745f 5f31 3349
3001760 6f73 7472 6561 6d5f 696e 6974 3a47 2830 2c31 2900 496f 7374 7265 616d 5f69 6e69 743a 5a63 496f 7374 7265 616d 5f69 6e69
3002040 743b 3b5f 5f63 745f 5f31 3349 6f73 7472 6561 6d5f 696e 6974 4676 205f 5f64 745f 5f31 3349 6f73 7472 6561 6d5f 696e 6974
3002120 4676 203b 7374 6473 7461 7475 735f 5f31 3349 6f73 7472 6561 6d5f 696e 6974 2069 6e69 7463 6f75 6e74 5f5f 3133 496f 7374
3002200 7265 616d 5f69 6e69 7420 3b40 696f 733b 0069 6f73 7472 6561 6d5f 696e 6974 3a53 2830 2c34 3029 0047 5054 3a74 2830 2c31
3002260 3329 0073 6d61 6e69 705f 696e 743a 5428 302c 3431 293d 7338 6663 745f 5f31 3073 6d61 6e69 705f 696e 743a 2830 2c34 3229
3002340 3d2a 2830 2c34 3329 3d66 2830 2c33 3529 2c30 2c33 323b 6172 675f 5f31 3073 6d61 6e69 705f 696e 743a 2830 2c31 292c 3332
3002420 2c33 323b 3b00 736d 616e 6970 5f69 6e74 3a5a 6373 6d61 6e69 705f 696e 743b 3b5f 5f63 745f 5f31 3073 6d61 6e69 705f 696e
3002500 7446 5046 5233 696f 7369 5f52 3369 6f73 6920 3b3b 5f5f 6c73 5f5f 4652 376f 7374 7265 616d 5231 3073 6d61 6e69 705f 696e
3002560 7420 5f5f 7273 5f5f 4652 3769 7374 7265 616d 5231 3073 6d61 6e69 705f 696e 7420 3b00 7361 7070 6c79 5f69 6e74 3a54 2830
3002640 2c34 3429 3d73 3466 6374 5f5f 3130 7361 7070 6c79 5f69 6e74 3a28 302c 3432 292c 302c 3332 3b3b 0073 6170 706c 795f 696e
3002720 743a 5a63 7361 7070 6c79 5f69 6e74 3b3b 5f5f 6374 5f5f 3130 7361 7070 6c79 5f69 6e74 4650 4652 3369 6f73 695f 5233 696f
3003000 7320 5f5f 636c 5f5f 3130 7361 7070 6c79 5f69 6e74 4669 203b 3b3b 0069 6d61 6e69 705f 696e 743a 5428 302c 3435 293d 7338
3003060 6663 745f 5f31 3069 6d61 6e69 705f 696e 743a 2830 2c34 3629 3d2a 2830 2c34 3729 3d66 2830 2c34 3929 3d2a 2830 2c33 3429
3003140 2c30 2c33 323b 6172 675f 5f31 3069 6d61 6e69 705f 696e 743a 2830 2c31 292c 3332 2c33 323b 3b00 696d 616e 6970 5f69 6e74
3003220 3a5a 6369 6d61 6e69 705f 696e 743b 3b5f 5f63 745f 5f31 3069 6d61 6e69 705f 696e 7446 5046 5237 6973 7472 6561 6d69 5f52
3003300 3769 7374 7265 616d 6920 3b3b 5f5f 7273 5f5f 4652 3769 7374 7265 616d 5231 3069 6d61 6e69 705f 696e 7420 3b00 6961 7070
3003360 6c79 5f69 6e74 3a54 2830 2c34 3929 3d73 3466 6374 5f5f 3130 6961 7070 6c79 5f69 6e74 3a28 302c 3436 292c 302c 3332 3b3b
3003440 0069 6170 706c 795f 696e 743a 5a63 6961 7070 6c79 5f69 6e74 3b3b 5f5f 6374 5f5f 3130 6961 7070 6c79 5f69 6e74 4650 4652
3003520 3769 7374 7265 616d 695f 5237 6973 7472 6561 6d20 5f5f 636c 5f5f 3130 6961 7070 6c79 5f69 6e74 4669 203b 3b3b 006f 6d61
3003600 6e69 705f 696e 743a 5428 302c 3530 293d 7338 6663 745f 5f31 306f 6d61 6e69 705f 696e 743a 2830 2c35 3129 3d2a 2830 2c35
3003660 3229 3166 2830 2c33 3629 2c30 2c33 323b 6172 675f 5f31 306f 6d61 6e69 705f 696e 743a 2830 2c31 292c 3332 2c33 323b 3b00
3003740 6f6d 616e 6970 5f69 6e74 3a5a 636f 6d61 6e69 705f 696e 743b 3b5f 5f63 745f 5f31 306f 6d61 6e69 705f 696e 7446 5046 5237
3004020 6f73 7472 6561 6d69 5f52 376f 7374 7265 616d 6920 3b3b 5f5f 6c73 5f5f 4652 376f 7374 7265 616d 5231 306f 6d61 6e69 705f
3004100 696e 7420 3b00 6f61 7070 6c79 5f69 6e74 3a54 2830 2c35 3329 3d73 3466 6374 5f5f 3130 6f61 7070 6c79 5f69 6e74 3a28 302c
3004160 3531 292c 302c 3332 3b3b 006f 6170 706c 795f 696e 743a 5a63 6f61 7070 6c79 5f69 6e74 3b3b 5f5f 6374 5f5f 3130 6f61 7070
3004240 6c79 5f69 6e74 4650 4652 376f 7374 7265 616d 695f 5237 6f73 7472 6561 6d20 5f5f 636c 5f5f 3130 6f61 7070 6c79 5f69 6e74
3004320 4669 203b 3b3b 0069 6f6d 616e 6970 5f69 6e74 3a54 2830 2c35 3429 3d73 3866 6374 5f5f 3131 696f 6d61 6e69 705f 696e 743a
3004400 2830 2c35 3529 3d2a 2830 2c35 3629 3d66 2830 2c35 3729 3d2a 2830 2c33 3729 2c30 2c33 323b 6172 675f 5f31 3169 6f6d 616e
3004460 6970 5f69 6e74 3a28 302c 3129 2c33 322c 3332 3b3b 0069 6f6d 616e 6970 5f69 6e74 3a5a 6369 6f6d 616e 6970 5f69 6e74 3b3b
3004540 5f5f 6374 5f5f 3131 696f 6d61 6e69 705f 696e 7446 5046 5238 696f 7374 7265 616d 695f 5238 696f 7374 7265 616d 6920 3b3b
3004620 5f5f 6c73 5f5f 4652 3869 6f73 7472 6561 6d52 3131 696f 6d61 6e69 705f 696e 7420 5f5f 7273 5f5f 4652 3869 6f73 7472 6561
3004700 6d52 3131 696f 6161 6e69 705f 696e 7420 3b00 696f 6170 706c 795f 696e 743a 5428 302c 3538 293d 7334 6663 745f 5f31 3169
3004760 6f61 7070 6c79 5f69 6e74 3a28 302c 3535 292c 302c 3332 3b3b 0069 6f61 7070 6c79 5f69 6e74 3a5a 6369 6f61 7070 6c79 5f69
3005040 6e74 3b3b 5f5f 6374 5f5f 3131 696f 6170 706c 795f 696e 7446 5046 5238 696f 7374 7265 616d 695f 5238 696f 7374 7265 616d
3005120 205f 5f63 6c5f 5f31 3169 6f61 7070 6c79 5f69 6e74 4669 203b 3b3b 0073 6d61 6e69 705f 6c6f 6e67 3a54 2830 2c35 3929 3d73
3005200 3866 6374 5f5f 3131 736d 616e 6970 5f6c 6f6e 673a 2830 2c34 3229 2c30 2c33 323b 6172 675f 5f31 3173 6d61 6e69 705f 6c6f
3005260 6e67 3a28 302c 3129 2c33 322c 3332 3b3b 0073 6d61 6e69 705f 6c6f 6e67 3a5a 6373 6d61 6e69 705f 6c6f 6e67 3b3b 5f5f 6374
3005340 5f5f 3131 736d 616e 6970 5f6c 6f6e 6746 5046 5233 696f 736c 5f52 3369 6f73 6c20 3b3b 5f5f 6c73 5f5f 4652 376f 7374 7265
3005420 616d 5231 3173 6461 6e69 705f 6c6f 6e67 205f 5f72 735f 5f46 5237 6973 7472 6561 6d52 3131 736d 616e 6970 5f6c 6f6e 6720
```

```
3005500 3b00 7361 7070 6c79 5f6c 6f6e 673a 5428 302c 3630 293d 7334 6663 745f 5f31 3173 6170 706c 795f 6c6f 6e67 3a28 302c 3432
3005560 292c 302c 3332 3b3b 0073 6170 706c 795f 6c6f 6e67 3a5a 6373 6170 706c 795f 6c6f 6e67 3b3b 5f5f 6374 5f5f 3131 7361 7070
3005640 6c79 5f6c 6f6e 6746 5046 5233 696f 736c 5f52 3369 6f73 205f 5f63 6c5f 5f31 3173 6170 706c 795f 6c6f 6e67 466c 203b 3b3b
3005720 0069 6d61 6e69 705f 6c6f 6e67 3a54 2830 2c36 3129 3d73 3866 6374 5f5f 3131 696d 616e 6970 5f6c 6f6e 673a 2830 2c34 3629
3006000 2c30 2c33 323b 6172 675f 5f31 3169 6d61 6e69 705f 6c6f 6e67 3a28 302c 3129 2c33 322c 3332 3b3b 0069 6d61 6e69 705f 6c6f
3006060 6e67 3a5a 6369 6161 6e69 705f 6c6f 6e67 3b3b 5f5f 6374 5f5f 3131 6964 616e 6970 5f6c 6f6e 6746 5046 5237 6973 7472 6561
3006140 6d6c 5f52 3769 7374 7265 616d 6c20 3b3b 5f5f 7273 5f5f 4652 3769 7374 7265 616d 5231 3169 6d61 6e69 705f 6c6f 6e67 203b
3006220 0069 6170 706c 795f 6c6f 6e67 3a54 2830 2c36 3229 3d73 3466 6374 5f5f 3131 6961 7070 6c79 5f6c 6f6e 673a 2830 2c34 3629
3006300 2c30 2c33 323b 3b00 6961 7070 6c79 5f6c 6f6e 673a 5a63 6961 7070 6c79 5f6c 6f6e 673b 3b5f 5f63 745f 5f31 3169 6170 706c
3006360 795f 6c6f 6e67 4650 4652 3769 7374 7265 6164 6c5f 5237 6973 7472 6561 6d20 5f5f 636c 5f5f 3131 6961 7070 6c79 5f6c 6f6e
3006440 6746 6c20 3b3b 3b00 6f6d 616e 6970 5f6c 6f6e 673a 5428 302c 3633 293d 7338 6663 745f 5f31 316f 6d61 6e69 705f 6c6f 6e67
3006520 3a28 302c 3531 292c 302c 3332 3b61 7267 5f5f 3131 6f6d 616e 6970 5f6c 6f6e 673a 2830 2c31 292c 3332 2c33 323b 3b00 6f6d
3006600 616e 6970 5f6c 6f6e 673a 5a63 6f6d 616e 6970 5f6c 6f6e 673b 3b5f 5f63 745f 5f31 316f 6d61 6e69 705f 6c6f 6e67 4650 4652
3006660 376f 7374 7265 616d 6c5f 5237 6f73 7472 6561 6d6c 203b 3b5f 5f6c 735f 5f46 5237 6f73 7472 6561 6d52 3131 6f6d 616e 6970
3006740 5f6c 6f6e 6720 3b00 6f61 7070 6c79 5f6c 6f6e 673a 5428 302c 3634 293d 7334 6663 745f 5f31 316f 6170 706c 795f 6c6f 6e67
3007020 3a28 302c 3531 292c 302c 3332 3b3b 006f 6170 706c 795f 6c6f 6e67 3a5a 636f 6170 706c 795f 6c6f 6e67 3b3b 5f5f 6374 5f5f
3007100 3131 6f61 7070 6c79 5f6c 6f6e 6746 5046 5237 6f73 7472 6561 6d6c 5f52 376f 7374 7265 616d 205f 5f63 6c5f 5f31 316f 6170
3007160 706c 795f 6c6f 6e67 466c 203b 3b3b 0069 6f61 616e 6970 5f6c 6f6e 673a 5428 302c 3635 293d 7338 6663 745f 5f31 3269 6f6d
3007240 616e 6970 5f6c 6f6e 673a 2830 2c35 3529 2c30 2c33 323b 6172 675f 5f31 3269 6f6d 616e 6970 5f6c 6f6e 673a 2830 2c31 292c
3007320 3332 2c33 323b 3b00 696f 6d61 6e69 705f 6c6f 6e67 3a5a 6369 6f6d 616e 6970 5f6c 6f6e 673b 3b5f 5f63 745f 5f31 3269 6f6d
3007400 616e 6970 5f6c 6f6e 6746 5046 5238 696f 7374 7265 616d 6c5f 5238 696f 7374 7265 616d 6c20 3b3b 5f5f 6c73 5f5f 4652 3869
3007460 6f73 7472 6561 6d52 3132 696f 6d61 6e69 705f 6c6f 6e67 205f 5f72 735f 5f46 5238 696f 7374 7265 616d 5231 3269 6f6d 616e
3007540 6970 5f6c 6f6e 6720 3b00 696f 6170 706c 795f 6c6f 6e67 3a54 2830 2c36 3629 3d73 3466 6374 5f5f 3132 696f 6170 706c 795f
3007620 6c6f 6e67 3a28 302c 3535 292c 302c 3332 3b3b 0069 6f61 7070 6c79 5f6c 6f6e 673a 5a63 696f 6170 706c 795f 6c6f 6e67 3b3b
3007700 5f5f 6374 5f5f 3132 696f 6170 706c 795f 6c6f 6e67 4650 4652 3869 6f73 7472 6561 6d6c 5f52 3869 6f73 7472 6561 6d20 5f5f
3007760 636c 5f5f 3132 696f 6170 706c 795f 6c6f 6e67 466c 203b 3b3b 0073 7464 696f 6275 663a 5428 302c 3637 293d 7335 3261 6c6c
3010040 6f63 5f5f 3973 7472 6561 6d62 7566 3a28 302c 3429 2c30 2c31 363b 785f 756e 6275 665f 5f39 7374 7265 616d 6275 663a 2830
3010120 2c34 292c 3136 2c31 363b 785f 6261 7365 5f5f 3973 7472 6561 6d62 7566 3a28 302c 3230 292c 3332 2c33 323b 785f 7062 6173
3010200 655f 5f39 7374 7265 616d 6275 663a 2830 2c32 3029 2c36 342c 3332 3b78 5f70 7074 725f 5f39 7374 7265 616d 6275 663a 2830
3010260 2c32 3029 2c39 362c 3332 3b78 5f65 7070 7472 5f5f 3973 7472 6561 6d62 7566 3a28 302c 3230 292c 3132 382c 3332 3b78 5f67
3010340 7074 725f 5f39 7374 7265 616d 6275 663a 2830 2c32 3029 2c31 3630 2c33 323b 785f 6567 7074 725f 5f39 7374 7265 616d 6275
3010420 663a 2830 2c32 3029 2c31 3932 2c33 323b 5c00 785f 6562 6163 6b5f 5f39 7374 7265 616d 6275 663a 2830 2c32 3029 2c32 3234
3010500 2c33 323b 785f 626c 656e 5f5f 3973 7472 6561 6d62 7566 3a28 302c 3129 2c32 3536 2c33 323b 5f5f 7670 7472 5f5f 3973 7472
3010560 6561 6d62 7566 3a28 302c 3333 292c 3238 382c 3332 3b66 705f 5f38 7374 6469 6f62 7566 3a28 302c 3638 293d 2a28 302c 3138
3010640 293d 7873 5f69 6f62 7566 3a2c 3332 302c 3332 3b6c 6173 745f 6f70 5f5f 3973 7464 696f 6275 663a 2830 2c31 292c 3335 322c
3010720 3332 3b62 7566 5f5f 3873 7464 696f 6275 663a 2833 2c36 3929 3461 7228 302c 3129 3b30 3b31 3b28 302c 3229 2c33 3834 2c31
3011000 363b 3b00 7374 6469 6f62 7566 3a5a 6373 7464 696f 6275 663b 7374 7265 616d 6275 663b 6f76 6572 666c 6f77 5f5f 3873 7464
3011060 696f 6275 6646 6920 756e 6465 7266 6c6f 775f 5f38 7374 6469 6f62 7566 4676 2073 796e 635f 5f38 7374 6469 6f62 7566 4676
3011140 2073 6565 6b6f 6666 5f5f 3873 7464 696f 6275 6646 6c38 7365 656b 5f64 6972 6920 7062 6163 6b66 6169 6c5f 5f38 7374 6469
3011220 6f62 7566 4669 205f 5f63 745f 5f38 7374 6469 6f62 7566 4650 365f 696f 6275 6620 5f5f 6374 5f5f 3873 7464 696f 6275 6646
3011300 5243 3873 7464 696f 6275 6620 5c00 7374 6469 6f66 696c 655f 5f38 7374 6469 6f62 7566 4676 205f 5f64 745f 5f38 7374 6469
3011360 6f62 7566 4676 203b 3b3b 0066 696c 6562 7566 3a54 2830 2c37 3029 3d73 3634 616c 6c6f 635f 5f39 7374 7265 616d 6275 663a
3011440 2830 2c34 292c 302c 3136 3b78 5f75 6e62 7566 5f5f 3973 7472 6561 6d62 7566 3a28 302c 3429 2c31 362c 3136 3b78 5f62 6173
3011520 655f 5f39 7374 7265 616d 6275 663a 2830 2c32 3029 2c33 322c 3332 3b78 5f70 6261 7365 5f5f 3973 7472 6561 6d62 7566 3a28
3011600 302c 3230 292c 3634 2c33 323b 785f 7070 7472 5f5f 3973 7472 6561 6d62 7566 3a28 302c 3230 292c 3936 2c33 323b 785f 6570
3011660 7074 725f 5f39 7374 7265 616d 6275 663a 2830 2c32 3029 2c31 3238 2c33 323b 785f 6770 7472 5f5f 3973 7472 6561 6d62 7566
3011740 3a28 302c 3230 292c 3136 302c 3332 3b78 5f65 6770 7472 5f5f 3973 7472 6561 6d62 7566 3a28 302c 3230 292c 3139 322c 3332
3012020 3b5c 0078 5f65 6261 636b 5f5f 3973 7472 6561 6d62 7566 3a28 302c 3230 292c 3232 342c 3332 3b78 5f62 6c65 6e5f 5f39 7374
3012100 7265 616d 6275 663a 2830 2c31 292c 3235 362c 3332 3b5f 5f76 7074 725f 5f39 7374 7265 616d 6275 663a 2830 2c33 3329 2c32
3012160 3838 2c33 323b 7866 645f 5f37 6669 6c65 6275 663a 2830 2c31 292c 3332 302c 3332 3b6d 6f64 655f 5f37 6669 6c65 6275 663a
3012240 2830 2c31 292c 3335 322c 3332 3b6f 7065 6e65 645f 5f37 6669 6c65 6275 663a 2830 2c32 292c 3338 342c 383b 6c61 7374 5f73
3012320 6565 6b5f 5f37 6669 6c65 6275 663a 2830 2c31 292c 3431 362c 3332 3b69 6e5f 7374 6172 745f 5f37 6669 6c65 6275 663a 2830
3012400 2c32 3029 2c34 3438 2c33 323b 6c61 6865 6164 5f5f 3766 696c 6562 7566 3a28 302c 3639 292c 3438 302c 3136 3b3b 006f 7065
3012460 6e70 726f 745f 5f37 6669 6c65 6275 663a 4728 302c 3129 0066 696c 6562 7566 3a5a 6366 696c 6562 7566 3b73 7472 6561 6d62
3012540 7566 3b5f 5f63 745f 5f37 6669 6c65 6275 6646 7620 5f5f 6374 5f5f 3766 696c 6562 7566 4669 205f 5f63 745f 5f37 6669 6c65
```

```
3012620 6275 6646 6950 6354 3120 5f5f 6374 5f5f 3766 696c 6562 7566 4652 4337 6669 6c65 6275 6620 6973 5f6f 7065 6e5f 5f37 6669
3012700 6c65 6275 6646 7620 6664 5f5f 3766 696c 6562 7566 4676 206f 7065 6e5f 5f37 6669 6c65 6275 6646 5043 6369 5432 2061 7474
3012760 6163 685f 5f37 6669 6c65 6275 6646 6920 636c 6f73 655f 5f37 6669 6c65 6275 6646 7620 5c00 5f5f 6474 5f5f 3766 696c 6562
3013040 7566 4676 206f 7665 7266 6c6f 775f 5f37 6669 6c65 6275 6646 6920 756e 6465 7266 6c6f 775f 5f37 6669 6c65 6275 6646 7620
3013120 7379 6e63 5f5f 3766 696c 6562 7566 4676 2073 6565 6b6f 6666 5f5f 3766 696c 6562 7566 466c 3873 6565 6b5f 6469 7269 2073
3013200 6574 6275 665f 5f37 6669 6c65 6275 6646 5063 6920 6c61 7374 5f6f 705f 5f37 6669 6c65 6275 6646 7620 3b6f 7065 6e70 726f
3013260 745f 5f37 6669 6c65 6275 6620 3b3b 0066 7374 7265 616d 6261 7365 3a54 2830 2c37 3129 3d73 3133 3262 7566 5f5f 3131 6673
3013340 7472 6561 6d62 6173 653a 2830 2c37 3029 2c30 2c35 3132 3b5f 5f76 7074 725f 5f31 3166 7374 7265 616d 6261 7365 3a28 302c
3013420 3333 292c 3531 322c 3332 3b50 696f 733a 2830 2c33 3529 2c35 3434 2c33 323b 4f69 6f73 3a28 302c 3236 292c 3537 362c 3438
3013500 303b 3b00 6673 7472 6561 6d62 6173 653a 5a63 6673 7472 6561 6d62 6173 653b 696f 733b 5f5f 6374 5f5f 3131 6673 7472 6561
3013560 6d62 6173 6546 7620 5f5f 6374 5f5f 3131 6673 7472 6561 6d62 6173 6546 5043 6369 5432 205f 5f63 745f 5f31 3166 7374 7265
3013640 616d 6261 7365 4669 205f 5f63 745f 5f31 3166 7374 7265 616d 6261 7365 4669 5063 5431 205f 5f63 745f 5f31 3166 7374 7265
3013720 616d 6261 7365 4652 3131 6673 7472 6561 6d62 6173 6520 5f5f 6474 5f5f 3131 6673 7472 6561 6162 6173 6546 7620 6f70 656e
3014000 5f5f 3131 6673 7472 6561 6d62 6173 6546 5043 6369 5432 205c 0061 7474 6163 685f 5f31 3166 7374 7265 616d 6261 7365 4669
3014060 2063 6c6f 7365 5f5f 3131 6673 7472 6561 6d62 6173 6546 7620 7365 7462 7566 5f5f 3131 6673 7472 6561 6d62 6173 6546 5063
3014140 6920 7264 6275 665f 5f31 3166 7374 7265 616d 6261 7365 4676 2076 6572 6966 795f 5f31 3166 7374 7265 616d 6261 7365 4669
3014220 203b 3b3b 0073 7461 7465 5f76 616c 7565 3a74 2830 2c32 3129 0045 6e74 6974 795f 5479 7065 5f4e 616d 653a 4728 302c 3732
3014300 293d 6172 2830 2c31 293b 303b 323b 2830 2c32 3029 0042 6c6f 636b 5f54 7970 655f 4e61 6d65 3a47 2830 2c37 3329 3d61 7228
3014360 302c 3129 3b30 3b33 3b28 302c 3230 2900 5661 6c75 655f 5479 7065 5f4e 616d 653a 4728 302c 3733 2900 5069 6e5f 5479 7065
3014440 5f4e 616d 653a 4728 302c 3733 2900 5648 444c 5f50 696e 5f54 7970 655f 4e61 6d65 3a47 2830 2c37 3329 0050 6172 615f 436c
3014520 6173 735f 4e61 6d65 3a47 2830 2c37 3329 0042 7566 6665 725f 4172 7261 793a 4728 302c 3734 293d 6172 2830 2c31 293b 303b
3014600 3130 3233 3b28 302c 3229 0042 7566 6665 723a 4728 302c 3230 2900 2e2f 6878 782f 676c 6264 6566 732e 6878 7800 5661 6c75
3014660 655f 5479 7065 3a54 2830 2c37 3529 3d65 554e 4b4e 4f57 4e56 3a30 2c53 5452 494e 473a 312c 494e 5445 4745 523a 322c 464c
3014740 4f41 543a 332c 3b00 426c 6f63 6b5f 5479 7065 3a54 2830 2c37 3629 3d65 554e 4b4e 4f57 4e42 3a30 2c45 4e54 4954 593a 312c
3015020 4655 4e43 5449 4f4e 3a32 2c50 524f 4345 4455 5245 3a33 2c3b 0045 6e74 6974 795f 5479 7065 3a54 2830 2c37 3729 3d65 554e
3015100 4b4e 4f57 4e45 3a30 2c41 5243 4849 5445 4354 5552 453a 312c 5355 4250 524f 4752 414d 3a32 2c3b 0050 696e 5f54 7970 653a
3015160 5428 302c 3738 293d 6555 4e4b 4e4f 574e 503a 302c 494e 5049 4e3a 312c 4f55 5450 494e 3a32 2c49 4e4f 5554 5049 4e3a 332c
3015240 3b00 5061 7261 5f43 6c61 7373 3a54 2830 2c37 3929 3d65 554e 4b4e 4f57 4e43 3a30 2c46 4f52 4d41 4c3a 312c 4143 5455 414c
3015320 3a32 2c52 4553 4f4c 5645 443a 332c 3b00 424f 4f4c 4541 4e3a 5428 302c 3830 293d 6546 616c 7365 3a30 2c54 7275 653a 312c
3015400 3b00 426f 6f6c 6561 6e3a 5428 302c 3831 293d 6566 616c 7365 3a30 2c74 7275 653a 312c 3b00 4f62 6a65 6374 3a54 2830 2c38
3015460 3229 3d73 345f 5f76 7074 725f 5f36 4f62 6a65 6374 3a28 302c 3333 292c 302c 3332 3b3b 004f 626a 6563 743a 5a63 4f62 6a65
3015540 6374 3b3b 5f5f 6374 5f5f 364f 626a 6563 7446 7620 5f5f 6374 5f5f 364f 626a 6563 7446 5243 364f 626a 6563 7420 6572 726f
3015620 724d 656d 6f72 795f 5f36 4f62 6a65 6374 4650 6354 3120 6578 706c 6169 6e5f 5f36 4f62 6a65 6374 4650 6320 696e 4f72 6465
3015700 725f 5f36 4f62 6a65 6374 4650 364f 626a 6563 7420 3b3b 3b00 5f5f 7074 626c 5f5f 364f 626a 6563 745f 5f6d 6169 6e5f 7665
3015760 785f 6378 783a 4728 302c 3333 2900 5046 3a74 2830 2c31 3529 0050 4643 3a74 2830 2c31 3529 0050 4649 3a74 2830 2c31 3529
3016040 004e 4f62 6a65 6374 3a54 2830 2c38 3329 3d73 385f 5f76 7074 725f 5f36 4f62 6a65 6374 3a28 302c 3333 292c 302c 3332 3b6e
3016120 616d 655f 5f37 4e4f 626a 6563 743a 2830 2c32 3029 2c33 322c 3332 3b3b 004e 4f62 6a65 6374 3a5a 634e 4f62 6a65 6374 3b4f
3016200 626a 6563 743b 5f5f 6374 5f5f 374e 4f62 6a65 6374 4650 6320 5f5f 6374 5f5f 374e 4f62 6a65 6374 4652 4337 4e4f 626a 6563
3016260 7420 7365 744e 616d 655f 5f37 4e4f 626a 6563 7446 5063 2067 6574 4e61 6d65 5f5f 374e 4f62 6a65 6374 4676 2065 7870 6c61
3016340 696e 5f5f 374e 4f62 6a65 6374 4650 6320 6765 7441 7474 725f 5f37 4e4f 626a 6563 7446 6920 6765 7450 726f 705f 5f37 4e4f
3016420 626a 6563 7446 5063 6920 7365 7450 726f 705f 5f37 4e4f 626a 6563 7446 5063 5431 205c 0073 6574 5072 6f70 5f5f 374e 4f62
3016500 6a65 6374 4650 6369 2073 6574 5072 6f70 5f5f 374e 4f62 6a65 6374 4650 6366 2069 7347 5445 5f5f 374e 4f62 6a65 6374 4650
3016560 364f 626a 6563 7420 6973 4c54 455f 5f37 4e4f 626a 6563 7446 5036 4f62 6a65 6374 203b 3b3b 006f 7374 7265 616d 5f77 6974
3016640 6861 7373 6967 6e3a 5428 302c 3339 293d 7336 385f 5f76 7074 725f 5f37 6f73 7472 6561 6d3a 2830 2c33 3329 2c30 2c33 323b
3016720 5069 6f73 3a28 302c 3335 292c 3332 2c33 323b 4f69 6f73 3a28 302c 3236 292c 3634 2c34 3830 3b3b 006f 7374 7265 616d 5f77
3017000 6974 6861 7373 6967 6e3a 5a63 6f73 7472 6561 6d5f 7769 7468 6173 7369 676e 3b6f 7374 7265 616d 2069 6f73 3b5f 5f63 745f
3017060 5f31 386f 7374 7265 616d 5f77 6974 6861 7373 6967 6e46 7620 5f5f 6374 5f5f 3138 6f73 7472 6561 615f 7769 7468 6173 7369
3017140 676e 4652 3138 6f73 7472 6561 6d5f 7769 7468 6173 7369 676e 205f 5f64 745f 5f31 386f 7374 7265 616d 5f77 6974 6861 7373
3017220 6967 6e46 7620 5f5f 6173 5f5f 3138 6f73 7472 6561 6d5f 7769 7468 6173 7369 676e 4652 376f 7374 7265 616d 205c 005f 5f61
3017300 735f 5f31 386f 7374 7265 616d 5f77 6974 6861 7373 6967 6e46 5039 7374 7265 616d 6275 6620 3b3b 3b00 5046 423a 7428 302c
3017360 3135 2900 4c4e 4f62 6a65 6374 3a54 2830 2c38 3429 3d73 3132 5f5f 7670 7472 5f5f 364f 626a 6563 743a 2830 2c33 3329 2c30
3017440 2c33 323b 6e61 6165 5f5f 374e 4f62 6a65 6374 3a28 302c 3230 292c 3332 2c33 323b 6e65 7874 5f5f 384c 4e4f 626a 6563 743a
3017520 2830 2c38 3529 3d2a 2830 2c38 3429 2c36 342c 3332 3b3b 004c 4e4f 626a 6563 743a 5a63 4c4e 4f62 6a65 6374 3b4e 4f62 6a65
3017600 6374 3b5f 5f63 745f 5f38 4c4e 4f62 6a65 6374 4650 6350 384c 4e4f 626a 6563 7420 5f5f 6374 5f5f 384c 4e4f 626a 6563 7446
3017660 5243 384c 4e4f 626a 6563 7420 7365 744e 6578 745f 5f38 4c4e 4f62 6a65 6374 4650 384c 4e4f 626a 6563 7420 6765 744e 6578
```

```
3017740 745f 5f38 4c4e 4f62 6a65 6374 4676 203b 3b3b 004c 4f62 6a65 6374 3a54 2830 2c38 3629 3d73 385f 5f76 7074 725f 5f36 4f62
3020020 6a65 6374 3a28 302c 3333 292c 302c 3332 3b6e 6578 745f 5f37 4c4f 626a 6563 743a 2830 2c38 3729 3d2a 2830 2c38 3629 2c33
3020100 322c 3332 3b3b 004c 4f62 6a65 6374 3a5a 634c 4f62 6a65 6374 3b4f 626a 6563 743b 5f5f 6374 5f5f 374c 4f62 6a65 6374 4650
3020160 374c 4f62 6a65 6374 205f 5f63 745f 5f37 4c4f 626a 6563 7446 5243 374c 4f62 6a65 6374 2073 6574 4e65 7874 5f5f 374c 4f62
3020240 6a65 6374 4650 374c 4f62 6a65 6374 2067 6574 4e65 7874 5f5f 374c 4f62 6a65 6374 4676 203b 3b3b 004c 504f 626a 6563 743a
3020320 5428 302c 3838 293d 7331 325f 5f76 7074 725f 5f36 4f62 6a65 6374 3a28 302c 3333 292c 302c 3332 3b6e 6578 745f 5f37 4c4f
3020400 626a 6563 743a 2830 2c38 3729 2c33 322c 3332 3b6e 6f62 6a70 7472 5f5f 384c 504f 626a 6563 743a 2830 2c38 3929 3d2a 2830
3020460 2c38 3329 2c36 342c 3332 3b3b 004c 504f 626a 6563 743a 5a63 4c50 4f62 6a65 6374 3b4c 4f62 6a65 6374 3b5f 5f63 745f 5f38
3020540 4c50 4f62 6a65 6374 4650 374e 4f62 6a65 6374 5037 4c4f 626a 6563 7420 5f5f 6374 5f5f 384c 504f 626a 6563 7446 5243 384c
3020620 504f 626a 6563 7420 7365 744f 626a 6563 745f 5f38 4c50 4f62 6a65 6374 4650 374e 4f62 6a65 6374 2067 6574 4f62 6a65 6374
3020700 5f5f 384c 504f 626a 6563 7446 7620 6578 706c 6169 6e5f 5f38 4c50 4f62 6a65 6374 4650 6320 3b3b 3b00 5f5f 7074 626c 5f5f
3020760 384c 504f 626a 6563 745f 5f6d 6169 6e5f 7665 785f 6378 783a 4728 302c 3333 2900 4c69 7374 3a54 2830 2c39 3029 3d73 3132
3021040 636f 756e 745f 5f34 4c69 7374 3a28 302c 3129 2c30 2c33 323b 7074 724c 4f62 6a65 6374 5f5f 344c 6973 743a 2830 2c38 3729
3021120 2c33 322c 3332 3b5f 5f76 7074 725f 5f34 4c69 7374 3a28 302c 3333 292c 3634 2c33 323b 3b00 4c69 7374 3a5a 634c 6973 743b
3021200 3b5f 5f63 745f 5f34 4c69 7374 4676 205f 5f63 745f 5f34 4c69 7374 4652 4334 4c69 7374 205f 5f64 745f 5f34 4c69 7374 4676
3021260 2067 6574 436f 756e 745f 5f34 4c69 7374 4676 2067 6574 546f 705f 5f34 4c69 7374 4676 2073 6574 546f 705f 5f34 4c69 7374
3021340 4650 374c 4f62 6a65 6374 2065 7272 6f72 4d65 6d6f 7279 5f5f 344c 6973 7446 5063 5431 2062 726f 6164 6361 7374 5f5f 344c
3021420 6973 7446 4d36 4f62 6a65 6374 4676 5f76 2065 7870 6c61 696e 5f5f 344c 6973 7446 5063 205c 0069 6e73 6572 745f 5f34 4c69
3021500 7374 4650 374c 4f62 6a65 6374 2069 734d 6561 6265 725f 5f34 4c69 7374 4650 374c 4f62 6a65 6374 2069 734d 656d 6265 725f
3021560 5f34 4c69 7374 4650 6320 6973 4571 7561 6c5f 5f34 4c69 7374 4652 344c 6973 7420 7265 6d6f 7665 5f5f 344c 6973 7446 5063
3021640 203b 3b3b 005f 5f70 7462 6c5f 5f34 4c69 7374 5f5f 6d61 696e 5f76 6578 5f63 7878 3a47 2830 2c33 3329 0050 4c69 7374 3a54
3021720 2830 2c39 3129 3d73 3132 636f 756e 745f 5f34 4c69 7374 3a28 302c 3129 2c30 2c33 323b 7074 724c 4f62 6a65 6374 5f5f 344c
3022000 6973 743a 2830 2c38 3729 2c33 322c 3332 3b5f 5f76 7074 725f 5f34 4c69 7374 3a28 302c 3333 292c 3634 2c33 323b 3b00 504c
3022060 6973 743a 5a63 504c 6973 743b 4c69 7374 3b69 6e73 6572 745f 5f35 504c 6973 7446 5038 4c50 4f62 6a65 6374 2069 6e73 6572
3022140 745f 5f35 504c 6973 7446 5235 504c 6973 7420 536f 7274 5f50 4c69 7374 5f5f 3550 4c69 7374 4669 2072 6576 6572 7365 5f5f
3022220 3550 4c69 7374 4676 2069 6e73 6572 7441 6674 6572 5f5f 3550 4c69 7374 4650 384c 504f 626a 6563 7454 3120 7265 6d6f 7665
3022300 5f5f 3550 4c69 7374 4650 384c 504f 626a 6563 7420 7265 6d6f 7665 5f5f 3550 4c69 7374 4650 6320 6973 4d65 6d62 6572 5f5f
3022360 3550 4c69 7374 4650 6320 5c00 6973 4d65 6d62 6572 5f5f 3550 4c69 7374 4650 374c 4f62 6a65 6374 2069 7345 7175 616c 5f5f
3022440 3550 4c69 7374 4652 344c 6973 7420 6578 706c 6169 6e5f 5f35 504c 6973 7446 5063 205f 5f63 745f 5f35 504c 6973 7446 5243
3022520 3550 4c69 7374 205f 5f63 745f 5f35 504c 6973 7446 7620 3b3b 3b00 5f5f 7074 626c 5f5f 3550 4c69 7374 5f5f 6d61 696e 5f76
3022600 6578 5f63 7878 3a47 2830 2c33 3329 004c 6973 7449 7465 7261 746f 723a 5428 302c 3932 293d 7338 6c69 7374 5f5f 3132 4c69
3022660 7374 4974 6572 6174 6f72 3a28 302c 3933 293d 2a28 302c 3930 292c 302c 3332 3b70 5f5f 3132 4c69 7374 4974 6572 6174 6f72
3022740 3a28 302c 3837 292c 3332 2c33 323b 3b00 4c69 7374 4974 6572 6174 6f72 3a5a 634c 6973 7449 7465 7261 746f 723b 3b5f 5f63
3023020 745f 5f31 324c 6973 7449 7465 7261 746f 7246 5234 4c69 7374 2072 6573 6574 5f5f 3132 4c69 7374 4974 6572 6174 6f72 4676
3023100 2061 7474 6163 685f 5f31 324c 6973 7449 7465 7261 746f 7246 5234 4c69 7374 2067 6574 4375 7272 656e 745f 5f31 324c 6973
3023160 7449 7465 7261 746f 7246 7620 5f5f 7070 5f5f 3132 4c69 7374 4974 6572 6174 6f72 4676 203b 3b3b 0050 696e 4c65 6e67 7468
3023240 3a54 2830 2c39 3429 3d73 3136 5f5f 7670 7472 5f5f 364f 626a 6563 743a 2830 2c33 3329 2c30 2c33 323b 6e61 6d65 5f5f 374e
3023320 4f62 6a65 6374 3a28 302c 3230 292c 3332 2c33 323b 436c 656e 6774 685f 5f39 5069 6e4c 656e 6774 683a 2830 2c32 3029 2c36
3023400 342c 3332 3b49 6c65 6e67 7468 5f5f 3950 696e 4c65 6e67 7468 3a28 302c 3129 2c39 362c 3332 3b3b 0050 696e 4c65 6e67 7468
3023460 3a5a 6350 696e 4c65 6e67 7468 3b4e 4f62 6a65 6374 3b5f 5f63 745f 5f39 5069 6e4c 656e 6774 6846 5063 5431 205f 5f63 745f
3023540 5f39 5069 6e4c 656e 6774 6846 5243 3950 696e 4c65 6e67 7468 2073 6574 5f50 696e 4c65 6e67 7468 5f5f 3950 696e 4c65 6e67
3023620 7468 4650 6354 3120 6765 745f 495f 5069 6e4c 656e 6774 685f 5f39 5069 6e4c 656e 6774 6846 7620 6765 745f 495f 5069 6e4c
3023700 656e 6774 685f 5f39 5069 6e4c 656e 6774 6846 6920 3b3b 3b00 4d6f 6447 656e 3a54 2830 2c39 3529 3d73 3234 4269 7457 6964
3023760 7468 5f5f 364d 6f64 4765 6e3a 2830 2c31 292c 302c 3332 3b45 5374 6174 655f 5f36 4d6f 6447 656e 3a28 302c 3831 292c 3332
3024040 2c33 323b 5069 6e4e 616d 654c 656e 6774 685f 5f36 4d6f 6447 656e 3a28 302c 3931 292c 3634 2c39 363b 5f5f 7670 7472 5f5f
3024120 364d 6f64 4765 6e3a 2830 2c33 3329 2c31 3630 2c33 323b 3b00 4d6f 6447 656e 3a5a 634d 6f64 4765 6e3b 3b5f 5f63 745f 5f36
3024200 4d6f 6447 656e 4676 205f 5f63 745f 5f36 4d6f 6447 656e 4652 4336 4d6f 6447 656e 2073 6574 5f42 6974 5769 6474 685f 5f36
3024260 4d6f 6447 656e 4669 2073 6574 5f45 5374 6174 655f 5f36 4d6f 6447 656e 4637 426f 6f6c 6561 6e20 6765 745f 4553 7461 7465
3024340 5f5f 364d 6f64 4765 6e46 7620 7365 745f 5069 6e4c 656e 6774 685f 5f36 4d6f 6447 656e 4650 6354 3120 6765 745f 5069 6e4c
3024420 656e 6774 685f 5f36 4d6f 6447 656e 4650 6320 7365 7449 6e64 6578 5f5f 364d 6f64 4765 6e46 7620 5c00 7365 744e 616d 6549
3024500 6e64 6578 5f5f 364d 6f64 4765 6e46 5063 204c 6f61 645f 5648 444c 5f44 6174 615f 5f36 4d6f 6447 656e 4650 374e 4f62 6a65
3024560 6374 2043 6f6d 706f 7365 5f4d 6f64 4765 6e5f 4465 7363 7269 7074 6f72 5f5f 364d 6f64 4765 6e46 5063 2065 7870 6c61 696e
3024640 5f5f 364d 6f64 4765 6e46 7620 5f5f 6474 5f5f 364d 6f64 4765 6e46 7620 3b3b 3b00 5f5f 7074 626c 5f5f 364d 6f64 4765 6e5f
3024720 5f6d 6169 6e5f 7665 785f 6378 783a 4728 302c 3333 2900 4d47 5f53 7065 6369 6669 633a 5428 302c 3936 293d 7331 3274 6563
3025000 686e 6f6c 6f67 795f 5f31 314d 475f 5370 6563 6966 6963 3a28 302c 3230 292c 302c 3332 3b6c 6273 5f74 6563 684e 756d 5f5f
```

```
3025060 3131 4147 5f53 7065 6369 6669 633a 2830 2c31 292c 3332 2c33 323b 4d65 6d5f 7465 6368 4e75 6d5f 5f31 314d 475f 5370 6563
3025140 6966 6963 3a28 302c 3129 2c36 342c 3332 3b3b 004d 475f 5370 6563 6966 6963 3a5a 634d 475f 5370 6563 6966 6963 3b3b 5f5f
3025220 6374 5f5f 3131 4147 5f53 7065 6369 6669 6346 7620 5f5f 6474 5f5f 3131 4d47 5f53 7065 6369 6669 6346 7620 7365 745f 7465
3025300 6368 6e6f 6c6f 6779 5f6e 616d 655f 5f31 314d 475f 5370 6563 6966 6963 4650 6320 6765 745f 6c62 735f 7465 6368 4e75 6d5f
3025360 5f31 314d 475f 5370 6563 6966 6963 4676 2067 6574 5f4d 656d 5f74 6563 684e 756d 5f5f 3131 4147 5f53 7065 6369 6669 6346
3025440 7620 6765 745f 7465 6368 4e61 6d65 5f5f 3131 4147 5f53 7065 6369 6669 6346 7620 5c00 6578 706c 6169 6e5f 5f31 314d 475f
3025520 5370 6563 6966 6963 4650 6320 3b3b 3b00 494f 5f4d 616e 6167 6572 3a54 2830 2c39 3729 3d73 3336 6966 705f 5f31 3049 4f5f
3025600 4d61 6e61 6765 723a 2830 2c36 3829 2c30 2c33 323b 6f66 705f 5f31 3049 4f5f 4d61 6e61 6765 723a 2830 2c36 3829 2c33 322c
3025660 3332 3b6d 6670 5f5f 3130 494f 5f4d 616e 6167 6572 3a28 302c 3638 292c 3634 2c33 323b 6366 705f 5f31 3049 4f5f 4d61 6e61
3025740 6765 723a 2830 2c36 3829 2c39 362c 3332 3b49 4669 6c65 4e61 6165 5f5f 3130 494f 5f4d 616e 6167 6572 3a28 302c 3230 292c
3026020 3132 382c 3332 3b4f 4669 6c65 4e61 6d65 5f5f 3130 494f 5f4d 616e 6167 6572 3a28 302c 3230 292c 3136 302c 3332 3b4d 4669
3026100 6c65 4e61 6d65 5f5f 3130 494f 5f4d 616e 6167 6572 3a28 302c 3230 292c 3139 322c 3332 3b43 4669 6c65 4e61 6d65 5f5f 3130
3026160 494f 5f4d 616e 6167 6572 3a28 302c 3230 292c 3232 342c 3332 3b63 754c 696e 655f 5f31 3049 4f5f 4d61 6e61 6765 723a 2830
3026240 2c31 292c 3235 362c 3332 3b3b 0049 4f5f 4d61 6e61 6765 723a 5a63 494f 5f4d 616e 6167 6572 3b3b 5f5f 6374 5f5f 3130 494f
3026320 5f4d 616e 6167 6572 4650 6320 5f5f 6474 5f5f 3130 494f 5f4d 616e 6167 6572 4676 2049 4f43 6865 636b 5f5f 3130 494f 5f4d
3026400 616e 6167 6572 4676 2043 6f70 7946 696c 6554 6f4c 696e 655f 5f31 3049 4f5f 4d61 6e61 6765 7246 6920 436f 7079 4669 6c65
3026460 546f 456e 645f 5f31 3049 4f5f 4d61 6e61 6765 7246 7620 5374 6174 6d65 6e74 4861 6e64 656c 6572 5f5f 3130 494f 5f4d 616e
3026540 6167 6572 4650 6354 3169 205c 0043 6f70 7946 696c 6554 6f4b 6579 575f 5f31 3049 4f5f 4d61 6e61 6765 7246 5063 5431 2045
3026620 6174 5f53 7461 7465 6d65 6e74 5f5f 3130 494f 5f4d 616e 6167 6572 4650 6354 3120 575f 4f75 7446 696c 655f 5f31 3049 4f5f
3026700 4d61 6c61 6765 7246 5063 2057 5f4d 4669 6c65 5f5f 3130 494f 5f4d 616e 6167 6572 4650 6320 575f 4346 696c 655f 5f31 3049
3026760 4f5f 4d61 6e61 6765 7246 5063 203b 3b3b 005f 5f43 3535 3a54 2830 2c39 3829 3d75 3473 7661 6c75 653a 2830 2c32 3029 2c30
3027040 2c33 323b 6976 616c 7565 3a28 302c 3129 2c30 2c33 323b 5676 616c 7565 3a28 302c 3929 2c30 2c33 323b 3b00 5f5f 4335 353a
3027120 5a63 5f5f 4335 353b 3b3b 3b3b 0047 656e 5661 6c75 653a 5428 302c 3939 293d 7331 365f 5f76 7074 725f 5f36 4f62 6a65 6374
3027200 3a28 302c 3333 292c 302c 3332 3b6e 616d 655f 5f37 4e4f 626a 6563 743a 2830 2c32 3029 2c33 322c 3332 3b74 7970 655f 5f38
3027260 4765 6e56 616c 7565 3a28 302c 3735 292c 3634 2c33 323b 5f5f 4f35 355f 5f38 4765 6e56 616c 7565 3a28 302c 3938 292c 3936
3027340 2c33 323b 3b00 4765 6e56 616c 7565 3a5a 6347 656e 5661 6c75 653b 4e4f 626a 6563 743b 5f5f 6374 5f5f 3847 656e 5661 6c75
3027420 6546 7620 5f5f 6374 5f5f 3847 656e 5661 6c75 6546 5243 3847 656e 5661 6c75 6520 5f5f 6474 5f5f 3847 656e 5661 6c75 6546
3027500 7620 7365 745f 4765 6e56 616c 7565 5f74 7970 655f 5f38 4765 6e56 616c 7565 4650 6369 2073 6574 5f47 656e 5661 6c75 655f
3027560 7479 7065 5f5f 3847 656e 5661 6c75 6546 3130 5661 6c75 655f 5479 7065 2073 6574 5f47 656e 5661 6c75 655f 5f38 4765 6e56
3027640 616c 7565 4650 6320 5c00 7365 745f 4765 6e56 616c 7565 5f5f 3847 656e 5661 6c75 6546 6920 7365 745f 4765 6e56 616c 7565
3027720 5f5f 3847 656e 5661 6c75 6546 6620 6765 745f 4765 6e56 616c 7565 5f74 7970 655f 5f38 4765 6e56 616c 7565 4676 2067 6574
3030000 5f47 656e 5661 6c75 655f 735f 5f38 4765 6e56 616c 7565 4676 2067 6574 5f47 656e 5661 6c75 655f 695f 5f38 4765 6e56 616c
3030060 7565 4676 2067 6574 5f47 656e 5661 6c75 655f 665f 5f38 4765 6e56 616c 7565 4676 2065 7870 6c61 696e 5f5f 3847 656e 5661
3030140 6c75 6546 5063 205c 0063 6865 636b 5f5f 3847 656e 5661 6c75 6546 6920 3b3b 3b00 5f5f 7074 626c 5f5f 3847 656e 5661 6c75
3030220 655f 5f6d 6169 6e5f 7665 785f 6378 783a 4728 302c 3333 2900 7061 7261 6d65 7465 723a 5428 302c 3130 3029 3d73 3630 5f5f
3030300 7670 7472 5f5f 364f 626a 6563 743a 2830 2c33 3329 2c30 2c33 323b 6e61 6d65 5f5f 374e 4f62 6a65 6374 3a28 302c 3230 292c
3030360 3332 2c33 323b 6e61 6d65 5f5f 3970 6172 616d 6574 6572 3a28 302c 3230 292c 3634 2c33 323b 7479 7065 5f5f 3970 6172 616d
3030440 6574 6572 3a28 302c 3230 292c 3936 2c33 323b 7261 6e67 655f 5f39 7061 7261 6d65 7465 723a 2830 2c32 3029 2c31 3238 2c33
3030520 323b 736c 6963 655f 5f39 7061 7261 6d65 7465 723a 2830 2c32 3029 2c31 3630 2c33 323b 536c 6f77 5f5f 3970 6172 616d 6574
3030600 6572 3a28 302c 3129 2c31 3932 2c33 323b 5368 6967 685f 5f39 7061 7261 6d65 7465 723a 2830 2c31 292c 3232 342c 3332 3b5c
3030660 0050 436c 6173 735f 5f39 7061 7261 6d65 7465 723a 2830 2c37 3929 2c32 3536 2c33 323b 5058 5265 665f 5f39 7061 7261 6d65
3030740 7465 723a 2830 2c31 3031 293d 2a28 302c 3130 3029 2c32 3838 2c33 323b 6d6f 6465 5f5f 3970 6172 616d 6574 6572 3a28 302c
3031020 3738 292c 3332 302c 3332 3b76 616c 7565 5f5f 3970 6172 616d 6574 6572 3a28 302c 3939 292c 3335 322c 3132 383b 3b00 7061
3031100 7261 6d65 7465 723a 5a63 7061 7261 6d65 7465 723b 4e4f 626a 6563 743b 5f5f 6374 5f5f 3970 6172 616d 6574 6572 4676 205f
3031160 5f63 745f 5f39 7061 7261 6d65 7465 7246 5243 3970 6172 616d 6574 6572 205f 5f64 745f 5f39 7061 7261 6d65 7465 7246 7620
3031240 6765 745f 7061 7261 6d65 7465 725f 6d6f 6465 5f5f 3970 6172 616d 6574 6572 4676 2067 6574 5f70 6172 616d 6574 6572 5f63
3031320 6c61 7373 5f5f 3970 6172 616d 6574 6572 4676 2067 6574 5f70 6172 615f 736c 6f77 5f5f 3970 6172 616d 6574 6572 4676 205c
3031400 0067 6574 5f70 6172 615f 7368 6967 685f 5f39 7061 7261 6d65 7465 7246 7620 6765 745f 7061 7261 6d65 7465 725f 7261 6e67
3031460 655f 5f39 7061 7261 6d65 7465 7246 7620 6765 745f 7061 7261 6d65 7465 725f 7479 7065 5f5f 3970 6172 616d 6574 6572 4676
3031540 2067 6574 5f70 6172 616d 6574 6572 5f6e 6161 655f 5f39 7061 7261 6d65 7465 7246 7620 6765 745f 7061 7261 6d65 7465 725f
3031620 736c 6963 655f 5f39 7061 7261 6d65 7465 7246 7620 6765 745f 7061 7261 6d65 7465 725f 5058 5245 465f 5f39 7061 7261 6d65
3031700 7465 7246 3130 5061 7261 5f43 6c61 7373 205c 0067 6574 5f63 6f72 7265 6374 5f6c 656e 6774 685f 5f39 7061 7261 6d65 7465
3031760 7246 7620 6765 745f 7061 7261 5f6c 656e 6774 685f 5f39 7061 7261 6d65 7465 7246 7620 6765 745f 7061 7261 5f73 7461 7475
3032040 735f 5f39 7061 7261 6d65 7465 7246 7620 6765 745f 7061 7261 6d65 7465 725f 7661 6c75 655f 5f39 7061 7261 6d65 7465 7246
3032120 7620 6765 745f 7061 7261 6d65 7465 725f 7661 6c75 655f 7479 7065 5f5f 3970 6172 616d 6574 6572 4676 2067 6574 5f70 6172
```

```
3032200 616d 6574 6572 5f73 7661 6c75 655f 5f39 7061 7261 6d65 7465 7246 7620 5c00 6765 745f 7061 7261 6d65 7465 725f 6976 616c
3032260 7565 5f5f 3970 6172 616d 6574 6572 4676 2067 6574 5f70 6172 616d 6574 6572 5f66 7661 6c75 655f 5f39 7061 7261 6d65 7465
3032340 7246 7620 7365 745f 7061 7261 6d65 7465 725f 6e61 6d65 5f5f 3970 6172 616d 6574 6572 4650 6320 7365 745f 7061 7261 6d65
3032420 7465 725f 636c 6173 735f 5f39 7061 7261 6d65 7465 7246 3130 5061 7261 5f43 6c61 7373 2073 6574 5f70 6172 616d 6574 6572
3032500 5f74 7970 655f 5f39 7061 7261 6d65 7465 7246 5063 2073 6574 5f73 6172 616d 6574 6572 5f73 6c69 6365 5f5f 3970 6172 616d
3032560 6574 6572 4650 6320 5c00 7365 745f 7061 7261 6d65 7465 725f 7372 616e 6765 5f5f 3970 6172 616d 6574 6572 4650 6320 7365
3032640 745f 7061 7261 6d65 7465 725f 5358 5265 665f 5f39 7061 7261 6d65 7465 7246 5063 5035 626c 6f63 6b20 7365 745f 7061 7261
3032720 6d65 7465 725f 7261 6e67 655f 5f39 7061 7261 6d65 7465 7246 5063 2073 6574 5f70 6172 616d 6574 6572 5f6d 6f64 655f 5f39
3033000 7061 7261 6d65 7465 7246 5063 2073 6574 5f70 6172 616d 6574 6572 5f76 616c 7565 5f5f 3970 6172 616d 6574 6572 4650 6320
3033060 7365 745f 7061 7261 6d65 7465 725f 7661 6c75 655f 5f39 7061 7261 6d65 7465 7246 6920 5c00 7365 745f 7061 7261 6d65 7465
3033140 725f 7661 6c75 655f 5f39 7061 7261 6d65 7465 7246 6620 7365 745f 7061 7261 6d65 7465 725f 7661 6c75 655f 7479 7065 5f5f
3033220 3970 6172 616d 6574 6572 4650 6320 6765 745f 5648 444c 5f46 6f72 6d61 6c5f 5061 7261 6d5f 5f39 7061 7261 6d65 7465 7246
3033300 5063 6920 6765 745f 5648 444c 5f50 726d 7472 5f5f 3970 6172 616d 6574 6572 4650 6369 2067 6574 5f56 4844 4c5f 4578 7061
3033360 6e64 6564 5f46 6f72 6d61 6c5f 5061 7261 6d5f 5f39 7061 7261 6d65 7465 7246 5035 626c 6f63 6b50 6369 205c 0067 6574 5f56
3033440 4844 4c5f 4578 7061 6e64 6564 5f50 726d 7472 5f4d 6170 5f5f 3970 6172 616d 6574 6572 4650 3562 6c6f 636b 5063 6920 6578
3033520 706c 6169 6e5f 5f39 7061 7261 6d65 7465 7246 5063 203b 3b3b 005f 5f70 7462 6c5f 5f39 7061 7261 6d65 7465 725f 5f6d 6169
3033600 6e5f 7665 785f 6379 783a 4728 302c 3333 2909 626c 6f63 6b5f 6174 7472 6962 7574 6573 3a54 2830 2c31 3032 293d 7332 385f
3033660 5f76 7074 725f 5f36 4f62 6a65 6374 3a28 302c 3333 292c 302c 3332 3b6e 616d 655f 5f37 4e4f 626a 6563 743a 2830 2c32 3029
3033740 2c33 322c 3332 3b6e 616d 655f 5f31 3662 6c6f 636b 5f61 7474 7269 6275 7465 733a 2830 2c32 3029 2c36 342c 3332 3b76 616c
3034020 7565 5f5f 3136 626c 6f63 6b5f 6174 7472 6962 7574 6573 3a28 302c 3939 292c 3936 2c31 3238 3b3b 0062 6c6f 636b 5f61 7474
3034100 7269 6275 7465 733a 5a63 626c 6f63 6b5f 6174 7472 6962 7574 6573 3b4e 4f62 6a65 6374 3b5f 5f63 745f 5f31 3662 6c6f 636b
3034160 5f61 7474 7269 6275 7465 7346 5063 205f 5f63 745f 5f31 3662 6c6f 636b 5f61 7474 7269 6275 7465 7346 7620 5f5f 6374 5f5f
3034240 3136 626c 6f63 6b5f 6174 7472 6962 7574 6573 4652 4331 3662 6c6f 636b 5f61 7474 7269 6275 7465 7346 7620 5f5f 6374 5f5f
3034320 626c 6f63 6b5f 6174 7472 6962 7574 6573 4676 2073 6574 5f61 7474 7269 6275 7465 7320 5f5f 6474 5f5f 3136
3034400 7474 7269 6275 7465 7346 5063 205c 0073 6574 5f61 7474 7269 6275 7465 5f6e 616d 655f 5f31 3662 6c6f 636b 5f61
3034460 6962 7574 6573 4650 6320 7365 745f 6174 7472 6962 7574 655f 7661 6c75 655f 5f31 3662 6c6f 636b 5f61 7474 7269 6275 7465
3034540 7346 6920 7365 745f 6174 7472 6962 7574 655f 7661 6c75 655f 5f31 3662 6c6f 636b 5f61 7474 7269 6275 7465 7346 6620 7365
3034620 745f 6174 7472 6962 7574 655f 7479 7065 5f5f 3136 626c 6f63 6b5f 6174 7472 6962 7574 6573 4650 6320 6765 745f 6174 7472
3034700 6962 7574 655f 6e61 6d65 5f5f 3136 626c 6f63 6b5f 6174 7472 6962 7574 6573 4676 205c 0067 6574 5f61 7474 7269 6275 7465
3034760 5f74 7970 655f 5f31 3662 6c6f 636b 5f61 7474 7269 6275 7465 7346 7620 6765 745f 6174 7472 6962 7574 655f 7376 616c 7565
3035040 5f5f 3136 626c 6f63 6b5f 6174 7472 6962 7574 6573 4676 2067 6574 5f61 7474 7269 6275 7465 5f69 7661 6c75 655f 5f31 3662
3035120 6c6f 636b 5f61 7474 7269 6275 7465 7346 7620 6765 745f 6174 7472 6962 7574 655f 6676 616c 7565 5f5f 3136 626c 6f63 6b5f
3035200 6174 7472 6962 7574 6573 4676 2067 6574 5f61 7474 7269 6275 7465 5f76 616c 7565 5f5f 3136 626c 6f63 6b5f 6174 7472 6962
3035260 7574 6573 4676 205c 0065 7870 6c61 696e 5f5f 3136 626c 6f63 6b5f 6174 7472 6962 7574 6573 4650 6320 3b3b 3b00 5f5f 7074
3035340 626c 5f5f 3136 626c 6f63 6b5f 6174 7472 6962 7574 6573 5f5f 6d61 696e 5f76 6578 5f63 7878 3a47 2830 2c33 3329 0065 6e74
3035420 6974 793a 5428 302c 3130 3329 3d73 3630 5f5f 7670 7472 5f5f 364f 626a 6563 743a 2830 2c33 3329 2c30 2c33 323b 6e61 6d65
3035500 5f5f 374e 4f62 6a65 6374 3a28 302c 3230 292c 3332 2c33 323b 6e61 6d65 5f5f 3665 6e74 6974 793a 2830 2c32 3029 2c36 342c
3035560 3332 3b46 696c 654e 616d 655f 5f36 656e 7469 7479 3a28 302c 3230 292c 3936 2c33 323b 6172 6368 6e61 6d65 5f5f 3665 6e74
3035640 6974 793a 2830 2c32 3029 2c31 3238 2c33 323b 7479 7065 5f5f 3665 6e74 6974 793a 2830 2c31 292c 3136 302c 3332 3b61 7263
3035720 685f 6c69 6e65 5f5f 3665 6e74 6974 793a 2830 2c31 292c 3139 322c 3332 3b63 616c 6c5f 6c69 6e65 5f5f 3665 6e74 6974 793a
3036000 2830 2c31 292c 3232 342c 3332 3b5c 0070 7263 735f 6c69 6e65 5f5f 3665 6e74 6974 793a 2830 2c31 292c 3235 362c 3332 3b71
3036060 7561 6c69 6669 6564 5f5f 3665 6e74 6974 793a 2830 2c39 3129 2c32 3838 2c39 363b 7375 625f 626c 6f63 6b73 5f5f 3665 6e74
3036140 6974 793a 2830 2c39 3129 2c33 3834 2c39 363b 3b00 656e 7469 7479 3a5a 6365 6e74 6974 793b 4e4f 626a 6563 743b 5f5f 6374
3036220 5f5f 3665 6e74 6374 7946 7620 5f5f 6374 5f5f 3665 6e74 6974 7946 5243 3665 6e74 6974 7920 5f5f 6474 5f5f 3665 6e74 6974
3036300 7946 7620 7365 745f 656e 7469 7479 5f6e 616d 655f 5f36 656e 7469 7479 4650 6320 7365 745f 656e 7469 7479 5f66 696c 655f
3036360 5f36 656e 7469 7479 4650 6320 7365 745f 656e 7469 7479 5f61 7263 686e 616d 655f 5f36 656e 7469 7479 4650 6320 7365 745f
3036440 656e 7469 7479 5f74 7970 655f 5f36 656e 7469 7479 4650 6320 5c00 7365 745f 6172 6368 5f6c 696e 655f 5f36 656e 7469 7479
3036520 4669 2073 6574 5f63 616c 6c5f 6c69 6e65 5f5f 3665 6e74 6974 7946 6920 7365 745f 7072 6373 5f6c 696e 655f 5f36 656e 7469
3036600 7479 4669 2067 6574 5f65 6e74 6974 795f 6e61 6d65 5f5f 3665 6e74 6974 7946 7620 6765 745f 656e 7469 7479 5f61 7263 686e
3036660 616d 655f 5f36 656e 7469 7479 4676 2067 6574 5f65 6e74 6974 795f 6669 6c65 5f5f 3665 6e74 6974 7946 7620 6765 745f 656e
3036740 7469 7479 5f74 7970 655f 5f36 656e 7469 7479 4676 205c 0067 6574 5f61 7263 685f 6c69 6e65 5f5f 3665 6e74 6974 7946 7620
3037020 6765 745f 6361 6c6c 5f6c 696e 655f 5f36 656e 7469 7479 4676 2067 6574 5f70 7263 735f 6c69 6e65 5f5f 3665 6e74 6974 7946
3037100 7620 6973 4754 455f 5f36 656e 7469 7479 4650 364f 626a 6563 7420 6973 4c54 455f 5f36 656e 7469 7479 4650 364f 626a 6563
3037160 7420 6578 706c 6169 6e5f 5f36 656e 7469 7479 4650 6320 3b3b 3b00 5f5f 7074 626c 5f5f 3665 6e74 6974 795f 5f6d 6169 6e5f
3037240 7665 785f 6378 793a 4728 302c 3333 2900 626c 6f63 6b3a 5428 302c 3130 3429 3d73 3134 345f 5f76 7074 725f 5f36 4f62 6a65
```

```
3037320 6374 3a28 302c 3333 292c 302c 3332 3b6e 616d 655f 5f37 4e4f 626a 6563 743a 2830 2c32 3029 2c33 322c 3332 3b6e 616d 655f
3037400 5f35 626c 6f63 6b3a 2830 2c32 3029 2c36 342c 3332 3b74 7970 655f 5f35 626c 6f63 6b3a 2830 2c31 292c 3936 2c33 323b 4d47
3037460 5f4e 616d 655f 5f35 626c 6f63 6b3a 2830 2c32 3029 2c31 3238 2c33 323b 4d47 5f54 7970 655f 5f35 626c 6f63 6b3a 2830 2c32
3037540 3029 2c31 3630 2c33 323b 4d47 5f53 7562 5479 7065 5f5f 3562 6c6f 636b 3a28 302c 3230 292c 3139 322c 3332 3b50 6172 656e
3037620 745f 5f35 626c 6f63 6b3a 2830 2c31 3033 292c 3232 342c 3438 303b 5c00 4d47 4473 6372 7074 6e5f 5f35 626c 6f63 6b3a 2830
3037700 2c31 3035 293d 2a28 302c 3935 292c 3730 342c 3332 3b41 6374 7561 6c5f 5f35 626c 6f63 6b3a 2830 2c39 3129 2c37 3336 2c39
3037760 363b 466f 726d 616c 5f5f 3562 6c6f 636b 3a28 302c 3931 292c 3833 322c 3936 3b52 6573 5f6c 7665 645f 5f35 626c 6f63 6b3a
3040040 2830 2c39 3129 2c39 3238 2c39 363b 4174 7472 6962 7574 6573 5f5f 3562 6c6f 636b 3a28 302c 3931 292c 3130 3234 2c39 363b
3040120 4572 7253 7461 7475 735f 5f35 626c 6f63 6b3a 2830 2c31 292c 3131 3230 2c33 323b 3b00 626c 6f63 6b3a 5a63 626c 6f63 6b3b
3040200 4e4f 626a 6563 743b 5f5f 6374 5f5f 3562 6c6f 636b 4676 205f 5f63 745f 5f35 626c 6f63 6b46 5243 3562 6c6f 636b 205f 5f64
3040260 745f 5f35 626c 6f63 6b46 7620 7365 745f 626c 6f63 6b5f 6e61 6d65 5f5f 3562 6c6f 636b 4650 6320 7365 745f 626c 6f63 6b5f
3040340 7479 7065 5f5f 3562 6c6f 636b 4650 6320 6765 745f 626c 6f63 6b5f 6e61 6d65 5f5f 3562 6c6f 636b 4676 2067 6574 5f62 6c6f
3040420 636b 5f74 7970 655f 5f35 626c 6f63 6b46 7620 6765 745f 626c 6f63 6b5f 7061 7265 6e74 5f5f 3562 6c6f 636b 4676 205c 0067
3040500 6574 5f62 6c6f 636b 5f4d 6f64 4765 6e5f 5f35 626c 6f63 6b46 7620 6765 745f 466f 726d 616c 5f5f 3562 6c6f 636b 4676 2067
3040560 6574 5f41 5374 7561 6c5f 5f35 626c 6f63 6b46 7620 6765 745f 5265 736f 6c76 6564 5f5f 3562 6c6f 636b 4676 2067 6574 5f41
3040640 7474 7269 6275 7465 5f5f 3562 6c6f 636b 4676 2073 6574 4572 726f 725f 5f35 626c 6f63 6b46 6320 6765 7445 7272 6f72 5f5f
3040720 3562 6c6f 636b 4676 2067 6574 5f63 6f6d 705f 6c65 6e67 7468 5f5f 3562 6c6f 636b 4676 2069 7351 7561 6c69 6669 6564 5f5f
3041000 3562 6c6f 636b 4676 205c 0069 734c 5445 5f5f 3562 6c6f 636b 4650 364f 626a 6563 7420 6973 4754 455f 5f35 626c 6f63 6b46
3041060 5036 4f62 6a65 6374 2065 7870 6c61 696e 5f5f 3562 6c6f 636b 4650 6320 5265 7665 7273 6541 6c6c 4c69 7374 735f 5f35 626c
3041140 6f63 6b46 7620 4368 6563 6b50 6172 614c 6973 7473 5f5f 3562 6c6f 636b 4676 2043 6865 636b 5061 7261 6d4c 6973 745f 5f35
3041220 626c 6f63 6b46 5035 504c 6973 7420 6765 745f 5648 444c 5f43 6f6d 704c 6162 6c65 5f5f 3562 6c6f 636b 4650 6320 6765 745f
3041300 5648 444c 5f43 6f6d 704e 616d 655f 5f35 626c 6f63 6b46 5063 205c 0057 5f4d 475f 436f 6d70 4473 6372 7074 6e5f 5f35 626c
3041360 6f63 6b46 7620 575f 4d47 5f43 6865 636b 436f 6d70 5f5f 3562 6c6f 636b 4676 2057 5f56 4844 4c5f 436f 6d70 496e 7374 5f5f
3041440 3562 6c6f 636b 4676 2057 5f56 4844 4c5f 436f 6d70 4465 635f 5f35 626c 6f63 6b46 7620 575f 434c 5f41 7263 6842 6f64 795f
3041520 5f35 626c 6f63 6b46 7620 575f 434c 5f45 6e74 6974 7944 6563 5f5f 3562 6c6f 636b 4676 203b 3b3b 005f 5f70 7462 6c5f 5f35
3041600 626c 6f63 6b5f 5f6d 6169 6e5f 7665 785f 6378 783a 4728 302c 3333 2900 5f5f 6374 5f5f 3665 6e74 6974 7946 763a 6628 302c
3041660 3130 3629 3d2a 2830 2c31 3033 2900 5f5f 3074 6869 733a 7028 302c 3130 3629 002e 2f68 7878 2f65 6e74 6974 792e 6878 7800
3041740 5f5f 3074 6869 733a 7228 302c 3130 3629 005f 5f30 7468 6973 203a 5a74 6c00 5f5f 6374 5f5f 3665 6e74 6974 7946 7620 3a5a
3042020 7446 0044 6573 6967 6e55 6e69 743a 5428 302c 3130 3729 3d73 3532 5f5f 7670 7472 5f5f 364f 626a 6563 743a 2830 2c33 3329
3042100 2c30 2c33 323b 6e61 6d65 5f5f 374e 4f62 6a65 6374 3a28 302c 3230 292c 3332 2c33 323b 4465 556e 4e61 6d65 5f5f 3130 4465
3042160 7369 676e 556e 6974 3a28 302c 3230 292c 3634 2c33 323b 4669 6c65 4e61 6d65 5f5f 3130 4465 7369 676e 556e 6974 3a28 302c
3042240 3230 292c 3936 2c33 323b 4172 6368 4e61 6d65 5f5f 3130 4465 7369 676e 556e 6974 3a28 302c 3230 292c 3132 382c 3332 3b44
3042320 6555 6e54 7970 655f 5f31 3044 6573 6967 6e55 6e69 743a 2830 2c31 292c 3136 302c 3332 3b41 7263 684c 696e 655f 5f31 3044
3042400 6573 6967 6e55 6e69 743a 2830 2c31 292c 3139 322c 3332 3b51 7561 6c69 6669 6564 5f5f 3130 4465 7369 676e 556e 6974 3a28
3042460 302c 3931 292c 3232 342c 3936 3b53 7562 426c 6f63 6b73 5f5f 3130 4465 7369 676e 556e 6974 3a28 302c 3931 292c 3332 302c
3042540 3936 3b3b 0044 6573 6967 6e55 6e69 743a 5a63 4465 7369 676e 556e 6974 3b4e 4f62 6a65 6374 3b5f 5f63 745f 5f31 3044 6573
3042620 6967 6e55 6e69 7446 7620 5f5f 6374 5f5f 3130 4465 7369 676e 556e 6974 4650 6320 5f5f 6374 5f5f 3130 4465 7369 676e 556e
3042700 6974 4650 3665 6e74 6974 7920 5f5f 6374 5f5f 3130 4465 7369 676e 556e 6974 4652 4331 3044 6573 6967 6e55 6e69 7420 5f5f
3042760 6474 5f5f 3130 4465 7369 676e 556e 6974 4676 2073 6574 5f44 555f 4465 556e 4e61 6d65 5f5f 3130 4465 7369 676e 556e 6974
3043040 4650 6320 5c00 7365 745f 4455 5f46 696c 654e 616d 655f 5f31 3044 6573 6967 6e55 6e69 7446 5063 2073 6574 5f44 555f 4172
3043120 6368 4e61 6d65 5f5f 3130 4465 7369 676e 556e 6974 4650 6320 7365 745f 4455 5f44 6555 6e54 7970 655f 5f31 3044 6573 6967
3043200 6e55 6e69 7446 6920 7365 745f 4455 5f41 7263 684c 696e 655f 5f31 3044 6573 6967 6e55 6e69 7446 6920 6765 745f 4455 5f46
3043260 696c 654e 616d 655f 5f31 3044 6573 6967 6e55 6e69 7446 7620 4571 7561 6c5f 5f31 3044 6573 6967 6e55 6e69 7446 5036 656e
3043340 7469 7479 205c 0069 7347 5445 5f5f 3130 4465 7369 676e 556e 6974 4650 364f 626a 6563 7420 6973 4c54 455f 5f31 3044 6573
3043420 6967 6e55 6e69 7446 5036 4f62 6a65 6374 2067 6574 5f44 555f 5175 616c 6966 6965 645f 5f31 3044 6573 6967 6e55 6e69 7446
3043500 7620 6765 745f 4455 5f53 7562 426c 6f63 6b73 5f5f 3130 4465 7369 676e 556e 6974 4676 2045 7870 616e 645f 5648 444c 5f44
3043560 555f 5f31 3044 6573 6967 6e55 6e69 7446 7620 6578 706c 6169 6e5f 5f31 3044 6573 6967 6e55 6e69 7446 5063 203b 3b3b 005f
3043640 5f70 7462 6c5f 5f31 3044 6573 6967 6e55 6e69 745f 5f6d 6169 6e5f 7665 785f 6378 783a 4728 302c 3333 2900 4669 6c65 556e
3043720 6974 3a54 2830 2c31 3038 293d 7332 345f 5f76 7074 725f 5f36 4f62 6a65 6374 3a28 302c 3333 292c 302c 3332 3b6e 616d 655f
3044000 5f37 4e4f 626a 6563 743a 2830 2c32 3029 2c33 322c 3332 3b46 696c 654e 616d 655f 5f38 4669 6c65 556e 6974 3a28 302c 3230
3044060 292c 3634 2c33 323b 456e 7469 7479 4c69 7374 5f5f 3846 696c 6555 6e69 743a 2830 2c39 3129 2c39 362c 3936 3b3b 0046 696c
3044140 6555 6e69 743a 5a63 4669 6c65 556e 6974 3b4e 4f62 6a65 6374 3b5f 5f63 745f 5f38 4669 6c65 556e 6974 4676 205f 5f63 745f
3044220 5f38 4669 6c65 556e 6974 4650 6320 5f5f 6374 5f5f 3846 696c 6555 6e69 7446 5243 3846 696c 6555 6e69 7420 5f5f 6474 5f5f
3044300 3846 696c 6555 6e69 7446 7620 7365 745f 4655 5f46 696c 654e 616d 655f 5f38 4669 6c65 556e 6974 4650 6320 6765 745f 4655
3044360 5f46 696c 654e 616d 655f 5f38 4669 6c65 556e 6974 4676 2067 6574 5f45 6e74 6974 794c 6973 745f 5f38 4669 6c65 556e 6974
```

```
3044440 4676 205c 0045 7870 616e 645f 5648 444c 5f44 555f 5f38 4669 6c65 556e 6974 4676 2065 7870 6c61 696e 5f5f 3846 696c 6555
3044520 6e69 7446 5063 203b 3b3b 005f 5f70 7462 6c5f 5f38 4669 6c65 556e 6974 5f5f 6d61 696e 5f76 6578 5f63 7878 3a47 2830 2c33
3044600 3329 0041 6c6c 426c 6f63 6b73 3a54 2830 2c31 3039 293d 7334 345f 5f76 7074 725f 5f36 4e62 6a65 6374 3a28 302c 3333 292c
3044660 302c 3332 3b6e 616d 655f 5f37 4e4f 626a 6563 743a 2830 2c32 3029 2c33 322c 3332 3b42 6c6f 636b 4c69 7374 5f5f 3941 6c6c
3044740 426c 6f63 6b73 3a28 302c 3931 292c 3634 2c39 363b 4455 4c69 7374 5f5f 3941 6c6c 426c 6f63 6b73 3a28 302c 3931 292c 3136
3045020 302c 3936 3b46 554c 6973 745f 5f39 416c 6c42 6c6f 636b 733a 2830 2c39 3129 2c32 3536 2c39 363b 3b00 416c 6c42 6c6f 636b
3045100 733a 5a63 416c 6c42 6c6f 636b 733b 4e4f 626a 6563 743b 5f5f 6374 5f5f 3941 6c6c 426c 6f63 6b73 4676 205f 5f63 745f 5f39
3045160 416c 6c42 6c6f 636b 7346 5243 3941 6c6c 426c 6f63 6b73 205f 5f64 745f 5f39 416c 6c42 6c6f 636b 7346 7620 6765 745f 426c
3045240 5f63 6b4c 6973 745f 5f39 416c 6c42 6c6f 636b 7346 7620 6765 745f 4455 4c69 7374 5f5f 3941 6c6c 426c 6f63 6b73 4676 2067
3045320 6574 5f46 554c 6973 745f 5f39 416c 6c42 6c6f 636b 7346 7620 5265 6164 5f56 4844 4c5f 426c 6b46 695c 655f 5f39 416c 6c42
3045400 6c6f 636b 7346 5063 205c 0052 6576 6572 7365 5061 7261 6d4c 6973 7473 5f5f 3941 6c6c 426c 6f63 6b73 4676 206d 616b 655f
3045460 4455 4c69 7374 5f5f 3941 6c6c 426c 6f63 6b73 4676 206d 616b 655f 4655 4c69 7374 5f5f 3941 6c6c 426c 6f63 6b73 4676 2045
3045540 7870 616e 645f 5648 444c 5f46 555f 5f39 416c 6c42 6c6f 636b 7346 7620 6578 706c 6169 6e5f 5f39 416c 6c42 6c6f 636b 7346
3045620 5063 203b 3b3b 005f 5f70 7462 6c5f 5f39 416c 6c42 6c6f 636b 735f 5f6d 6169 6e5f 7665 785f 6378 783a 4728 302c 3333 2900
3045700 4d47 3a47 2830 2c31 3130 293d 2a28 302c 3936 2900 6161 696e 5f76 6578 2e63 7878 0042 6c6b 4669 6c65 3a53 2830 2c32 3029
3045760 005f 5f63 745f 5f39 416c 6c42 6c6f 636b 7346 763a 6628 302c 3131 3129 3d2a 2830 2c31 3039 2900 5f5f 3074 6869 733a 7028
3046040 302c 3131 3129 002e 2f68 7878 2f41 6c6c 426c 6f63 6b73 2e68 7878 005f 5f30 7468 6973 203a 5a74 6c00 5f5f 6374 5f5f 3941
3046120 6c6c 426c 6f63 6b73 4676 203a 5a74 4600 6d61 696e 3a46 2830 2c31 2900 5f5f 3061 7267 633a 7028 302c 3129 005f 5f30 6172
3046200 6776 3a70 2830 2c31 3929 006d 6169 6e5f 7665 782e 6378 7800 5f5f 3061 7267 6320 3a5a 746c 005f 5f30 6172 6776 203a 5a74
3046260 6c00 5f5f 3141 423a 2830 2c31 3039 2900 5f5f 3141 4220 3a5a 746c 0073 7472 5f61 6c6c 6f63 3a46 2830 2c32 3029 005f 5f30
3046340 733a 7028 302c 3230 2900 5f5f 3073 203a 5a74 6c00 5265 6164 4f70 7469 6f6e 735f 5f46 6950 5063 3a66 2830 2c32 2900 5f5f
3046420 3061 7267 633a 7028 302c 3129 005f 5f30 6172 6776 3a70 2830 2c31 3929 005f 5f30 6172 6763 203a 5a74 6c00 5f5f 3061 7267
3046500 7620 3a5a 746c 0052 6561 644f 7074 696f 6e73 5f5f 4669 5050 6320 3a5a 7446 005f 5f73 7469 5f5f 6d61 696e 5f76 6578 5f63
3046560 7878 5f45 6e74 6974 795f 5479 7065 5f4e 616d 655f 3a46 2830 2c32 2900 2f75 7372 2f43 432f 7375 6e34 2f69 6e63 6c2f 696f
3046640 7374 7265 616d 2e68 005f 5f30 5f5f 5874 6869 7330 3061 7177 306e 6b3a 7228 302c 3131 3029 005f 5f30 5f5f 5874 6869 7330
3046720 3061 7177 306e 6b20 3a5a 746c 006d 6169 6e5f 7665 782e 6378 7800 5f5f 7374 645f 5f6d 6169 6e5f 7665 785f 6378 785f 456e
3047000 7469 7479 5f54 7970 655f 4e61 6d65 5f3a 4628 302c 3229 002f 7573 722f 4343 2f73 756e 342f 696e 636c 2f69 6f73 7472 6561
3047060 6d2e 6800 5f5f 7674 626c 5f5f 3136 626c 6f63 6b5f 6174 7472 6962 7574 6573 5f5f 6d61 696e 5f76 6578 5f63 7878 3a47 2830
3047140 2c31 3132 293d 6172 2830 2c31 293b 303b 3130 3b28 302c 3135 2900 5f5f 7674 626c 5f5f 384c 504f 626a 6563 745f 5f6d 6169
3047220 6e5f 7665 785f 6378 783a 4728 302c 3131 3329 3361 7228 302c 3129 3b30 3b33 3b28 302c 3135 2900 7365 745f 4655 5f46 696c
3047300 654e 616d 655f 5f38 4669 6c65 556e 6974 4650 633a 6628 302c 3229 005f 5f30 7468 6973 3a70 2830 2c31 3134 293d 2a28 302c
3047360 3130 3829 005f 5f30 733a 7028 302c 3230 2900 2e2f 6878 782f 4669 6c65 556e 2e68 7878 005f 5f30 7468 6973 3a72 2830 2c31
3047440 3134 2900 5f5f 3074 6869 7320 3a5a 746c 005f 5f30 7320 3a5a 746c 0073 6574 5f46 555f 4669 6c65 4e61 6d65 5f5f 3846 696c
3047520 6555 6e69 7446 5063 203a 5a74 4600 6578 706c 6169 6e5f 5f31 3662 6c6f 636b 5f61 7474 7269 6275 7465 7346 5063 3a66 2830
3047600 2c32 2900 5f5f 3074 6869 733a 7028 302c 3131 3529 3d2a 2830 2c31 3032 2900 5f5f 3073 3a70 2830 2c32 3029 002e 2f68 7878
3047660 2f61 7474 7269 6275 7465 2e68 7878 005f 5f30 7468 6973 3a72 2830 2c31 3135 2900 5f5f 3074 6869 7320 3a5a 746c 005f 5f30
3047740 7320 3a5a 746c 0065 7870 6c61 696e 5f5f 3136 626c 6f63 6b5f 6174 7472 6962 7574 6573 4650 6320 3a5a 7446 0073 6574 5f70
3050020 6172 616d 6574 6572 5f76 616c 7565 5f74 7970 655f 5f39 7061 7261 6d65 7465 7246 5063 3a66 2830 2c32 2900 5f5f 3074 6869
3050100 733a 7028 302c 3130 3129 005f 5f30 733a 7028 302c 3230 2900 2e2f 6878 782f 7061 7261 6d65 7465 722e 6878 7800 5f5f 3074
3050160 6869 733a 7228 302c 3130 3129 005f 5f30 7468 6973 203a 5a74 6c00 5f5f 3073 203a 5a74 6c00 7365 745f 7061 7261 6d65 7465
3050240 725f 7661 6c75 655f 7479 7065 5f5f 3970 6172 616d 6574 6572 4650 6320 3a5a 7446 0065 7870 6c61 696e 5f5f 384c 504f 626a
3050320 6563 7446 5063 3a66 2830 2c32 2900 5f5f 3074 6869 733a 7028 302c 3131 3629 3d2a 2830 2c38 3829 005f 5f30 733a 7028 302c
3050400 3230 2900 2f68 6f6d 652f 6f73 6173 312f 612f 6162 2f73 7263 2f6e 6577 6f62 6a65 6374 732f 6878 782f 4c50 4f62 6a65 6374
3050460 5f64 622e 6878 7800 5f5f 3074 6869 733a 7228 302c 3131 3629 005f 5f30 7468 6973 203a 5a74 6c00 5f5f 3073 203a 5a74 6c00
3050540 6578 706c 6169 6e5f 5f38 4c50 4f62 6a65 6374 4650 6320 3a5a 7446 0069 734c 5445 5f5f 374e 4f62 6a65 6374 4650 364f 626a
3050620 6563 743a 6628 302c 3129 005f 5f30 7468 6973 3a70 2830 2c38 3929 005f 5f30 5f5f 4133 393a 7028 302c 3131 3729 3d2a 2830
3050700 2c38 3229 002f 696f 6d65 2f6f 7361 7331 2f61 2f61 622f 7372 632f 6e65 776f 626a 6563 7473 2f68 7878 2f4e 4f62 6a65 6374
3050760 5f64 622e 6878 7800 5f5f 3074 6869 7320 3a5a 746c 005f 5f30 5f5f 4133 3920 3a5a 746c 0069 734c 5445 5f5f 374e 4f62 6a65
3051040 6374 4650 364f 626a 6563 7420 3a5a 7446 0069 7347 5445 5f5f 374e 4f62 6a65 6374 4650 364f 626a 6563 743a 6628 302c 3129
3051120 005f 5f30 7468 6973 3a70 2830 2c38 3929 005f 5f30 5f5f 4133 383a 7028 302c 3131 3729 005f 5f30 7468 6973 203a 5a74 6c00
3051200 5f5f 305f 5f41 3338 203a 5a74 6c00 6973 4754 455f 5f37 4e4f 626a 6563 7446 5036 4f62 6a65 6374 203a 5a74 4600 7365 7450
3051260 726f 705f 5f37 4e4f 626a 6563 7446 5063 663a 6628 302c 3229 005f 5f30 7468 6973 3a70 2830 2c38 3929 005f 5f31 5f5f 4133
3051340 363a 7028 302c 3230 2900 5f5f 315f 5f41 3337 3a70 2830 2c31 3029 005f 5f30 7468 6973 203a 5a74 6c00 5f5f 315f 5f41 3336
3051420 203a 5a74 6c00 5f5f 315f 5f41 3337 203a 5a74 6c00 7365 7450 726f 705f 5f37 4e4f 626a 6563 7446 5063 6620 3a5a 7446 0073
3051500 6574 5072 6f70 5f5f 374e 4f62 6a65 6374 4650 6369 3a66 2830 2c32 2900 5f5f 3074 6869 733a 7028 302c 3839 2900 5f5f 315f
```

```
3051560  5f41 3334 3a70 2830 2c32 3029 005f 5f31 5f5f 4133 353a 7028 302c 3129 005f 5f30 7468 6973 203a 5a74 6c00 5f5f 315f 5f41
3051640  3334 203a 5a74 6c00 5f5f 315f 5f41 3335 203a 5a74 6c00 7365 7450 726f 705f 5f37 4e4f 626a 6563 7446 5063 6920 3a5a 7446
3051720  0073 6574 5072 6f70 5f5f 374e 4f62 6a65 6374 4659 6354 313a 6628 302c 3229 005f 5f30 7468 6973 3a70 2830 2c39 3929 005f
3052000  5f31 5f5f 4133 323a 7028 302c 3230 2900 5f5f 315f 5f41 3333 3a70 2830 2c32 3029 005f 5f30 7468 6973 203a 5a74 6c00 5f5f
3052060  315f 5f41 3332 203a 5a74 6c00 5f5f 315f 5f41 3333 203a 5a74 6c00 7365 7450 726f 705f 5f37 4e4f 626a 6563 7446 5063 5431
3052140  203a 5a74 4600 6765 7450 726f 705f 5f37 4e4f 626a 6563 7446 5063 693a 6628 302c 3230 2900 5f5f 3074 6869 733a 7028 302c
3052220  3839 2900 5f5f 305f 5f41 3330 3a70 2830 2c32 3029 005f 5f30 5f5f 4133 313a 7028 302c 3129 005f 5f30 7468 6973 203a 5a74
3052300  6c00 5f5f 305f 5f41 3330 203a 5a74 6c00 5f5f 305f 5f41 3331 203a 5a74 6c00 6765 7450 726f 705f 5f37 4e4f 626a 6563 7446
3052360  5063 6920 3a5a 7446 0067 6574 4174 7472 5f5f 374e 4f62 6a65 6374 4669 3a66 2830 2c32 3029 005f 5f30 7468 6973 3a70 2830
3052440  2c38 3929 005f 5f30 5f5f 4132 393a 7028 302c 3129 005f 5f30 7468 6973 203a 5a74 6c00 5f5f 305f 5f41 3239 203a 5a74 6c00
3052520  6765 7441 7474 725f 5f37 4e4f 626a 6563 7446 6920 3a5a 7446 0069 6e4f 7264 6572 5f5f 364f 626a 6563 7446 5036 4f62 6a65
3052600  6374 3a66 2830 2c31 2900 5f5f 3074 6869 733a 7028 302c 3131 3729 005f 5f30 5f5f 4132 373a 7028 302c 3131 3729 002f 686f
3052660  6d65 2f6f 7361 7331 2f61 2f61 622f 7372 632f 6e65 776f 626a 6563 7473 2f68 7878 2f4f 626a 6563 745f 6462 2e68 7878 005f
3052740  5f30 7468 6973 203a 5a74 6c00 5f5f 305f 5f41 3237 203a 5a74 6c00 696e 4f72 6465 725f 5f36 4f62 6a65 6374 4650 364f 626a
3053020  6563 7420 3a5a 7446 0075 7469 6c69 7469 6573 2e6f 005f 6c73 696c 6578 6964 005f 6d61 5f69 6400 5f6c 7369 6770 616c 6964
3053100  005f 6c73 696e 6373 6869 6400 2f68 6f6d 652f 6f73 6173 312f 612f 6162 2f73 7263 2f6e 6577 6f62 6a65 6374 732f 7072 6f67
3053160  2f00 7574 696c 6374 6965 732e 6300 696e 743a 7428 302c 3129 3d72 2830 2c31 293b 2d32 3134 3734 3833 3634 383b 3231 3437
3053240  3438 3336 3437 3b00 6368 6172 3a74 2830 2c32 293d 7228 302c 3229 3b30 3b31 3237 3b00 6c6f 6e67 3a74 2830 2c33 293d 7228
3053320  302c 3129 3b2d 3231 3437 3438 3336 3438 3b32 3134 3734 3833 3634 373b 0073 686f 7274 3a74 2830 2c34 293d 7228 302c 3129
3053400  3b2d 3332 3736 383b 3332 3736 373b 0075 6e73 6967 6e65 6420 6368 6172 3a74 2830 2c35 293d 7228 302c 3129 3b30 3b32 3535
3053460  3b00 756e 7369 676e 6564 2073 686f 7274 3a74 2830 2c36 293d 7228 302c 3129 3b30 3b36 3535 3335 3b00 756e 7369 676e 6564
3053540  206c 6f6e 673a 7428 302c 3729 3d72 2830 2c31 293b 303b 2d31 3b00 756e 7369 676e 6564 2069 6e74 3a74 2830 2c38 293d 7228
3053620  302c 3129 3b30 3b2d 313b 0066 6c6f 6174 3a74 2830 2c39 293d 7228 302c 3129 3b34 3b30 3b00 646f 7562 6c65 3a74 2830 2c31
3053700  3029 3d72 2830 2c31 293b 383b 303b 0076 6f69 643a 7428 302c 3131 293d 2830 2c31 3129 003f 3f3f 3a74 2830 2c31 3229 3d28
3053760  302c 3129 002f 7573 722f 696e 636c 7564 652f 7374 6469 6f2e 6800 5f69 6f62 7566 3a54 2831 2c31 293d 7332 305f 636e 743a
3054040  2830 2c31 292c 302c 3332 3b5f 7074 723a 2831 2c32 293d 2a28 302c 3529 2c33 322c 3332 3b5f 6261 7365 3a28 312c 3229 2c36
3054120  342c 3332 3b5f 6275 6673 697a 3a28 302c 3129 2c39 362c 3332 3b5f 666c 6167 3a28 302c 3429 2c31 3238 2c31 363b 5f66 696c
3054200  653a 2830 2c32 292c 3134 342c 383b 3b00 2f75 7372 2f69 6e63 6c75 6465 2f73 7472 696e 672e 6800 2f75 7372 2f69 6e63 6c75
3054260  6465 2f73 7472 696e 6773 2e68 002f 7573 722f 696e 636c 7564 652f 6374 7970 652e 6800 494f 4275 6666 3a47 2830 2c31 3329
3054340  3d2a 2830 2c32 2900 494f 4175 783a 4728 302c 3133 2900 4572 726f 7242 7566 6665 723a 4728 302c 3134 293d 6172 2830 2c31
3054420  293b 303b 3235 343b 2830 2c32 2900 745f 7965 733a 4728 302c 3135 293d 6172 2830 2c31 293b 303b 333b 2830 2c32 2900 745f
3054500  6e6f 3a47 2830 2c31 3629 3d61 7228 302c 3129 3b30 3b32 3b28 302c 3229 0061 5f79 6573 3a47 2830 2c31 3329 0061 5f6e 6f3a
3054560  4728 302c 3133 2900 5072 7445 7272 3a46 2830 2c31 3129 004e 3a70 2830 2c31 2900 533a 7028 302c 3229 0054 6578 743a 7028
3054640  302c 3133 2900 7030 3a70 2830 2c31 2900 7031 3a70 2830 2c31 2900 7032 3a70 2830 2c31 2900 7033 3a70 2830 2c31 2900 7034
3054720  3a70 2830 2c31 2900 7035 3a70 2830 2c31 2900 7036 3a70 2830 2c31 2900 7037 3a70 2830 2c31 2900 7038 3a70 2830 2c31 2900
3055000  7039 3a70 2830 2c31 2900 746f 5f75 7070 6572 3a46 2830 2c31 3329 0073 3a70 2830 2c31 3329 0070 3a28 302c 3133 2900 633a
3055060  2830 2c32 2900 746f 5f6c 6f77 6572 3a46 2830 2c31 3329 0073 3a70 2830 2c31 3329 0070 3a28 302c 3133 2900 633a 2830 2c32
3055140  2900 6f75 7443 6f6e 3a46 2830 2c31 3329 0054 6578 743a 7028 302c 3133 2900 7030 3a70 2830 2c31 2900 7031 3a70 2830 2c31
3055220  2900 7032 3a70 2830 2c31 2900 7033 3a70 2830 2c31 2900 7034 3a70 2830 2c31 2900 7035 3a70 2830 2c31 2900 7036 3a70 2830
3055300  2c31 2900 7037 3a70 2830 2c31 2900 7038 3a70 2830 2c31 2900 7039 3a70 2830 2c31 2900 2f68 6f6d 652f 6f73 6173 312f 612f
3055360  6162 2f73 7263 2f6e 6577 6f62 6a65 6374 732f 696e 636c 7564 652f 6c73 696e 6873 682e 6800 2f68 6f6d 652f 6f73 6173 312f
3055440  612f 6162 2f73 7263 2f6e 6577 6f62 6a65 6374 732f 696e 636c 7564 652f 6c73 696e 6873 682e 6800 6c73 696e 6873 6869 643a
3055520  5328 352c 3129 3361 7228 302c 3129 3b30 3b35 393b 2830 2c32 2900 2f68 6f6d 652f 6f73 6173 312f 612f 6162 2f73 7263 2f6e
3055600  6577 6f62 6a65 6374 732f 696e 636c 7564 652f 6c73 6967 7061 6c2e 6800 2f68 6f6d 652f 6f73 6173 312f 612f 6162 2f73 7263
3055660  2f6e 6577 6f62 6a65 6374 732f 696e 636c 7564 652f 6c73 6967 7061 6c2e 6800 6c73 6967 7061 6c69 643a 5328 362c 3129 3d61
3055740  7228 302c 3129 3b30 3b36 323b 2830 2c32 2900 2f68 6f6d 652f 6f73 6173 312f 612f 6162 2f73 7263 2f6e 6577 6f62 6a65 6374
3056020  732f 696e 636c 7564 652f 6d61 2e68 002f 686f 6165 2f6f 7361 7331 2f61 2f61 622f 7372 632f 6e65 776f 626a 6563 7473 2f69
3056100  6e63 6c75 6465 2f6d 612e 6800 6d61 5f69 643a 5328 372c 3129 3d61 7228 302c 3129 3b30 3b36 363b 2830 2c32 2900 706f 696e
3056160  7465 723a 7428 372c 3229 3d2a 2837 2c33 293d 6172 2830 2c31 293b 303b 303b 2837 2c34 293d 6172 2830 2c31 293b 303b 303b
3056240  2837 2c35 293d 6172 2830 2c31 293b 303b 303b 2837 2c36 293d 6172 2830 2c31 293b 303b 303b 2837 2c37 293d 6172 2830 2c31
3056320  293b 303b 303b 2837 2c38 293d 6172 2830 2c31 293b 303b 303b 2830 2c32 2900 626f 6f6c 6561 6e3a 7428 302c 3129 006d 615f
3056400  6772 6f75 703a 7428 372c 3929 3d2a 2837 2c31 3029 3d73 346d 615f 6772 6f75 703a 2830 2c31 292c 302c 3332 3b3b 0066 756e
3056460  6374 696f 6e3a 7428 372c 3131 293d 2a28 372c 3132 293d 6628 302c 3129 006d 656d 5f61 6c6c 6f63 6174 6564 3a47 2830 2c31
3056540  2900 6d65 6d5f 7573 6564 3a47 2830 2c31 2900 6f75 745f 6f66 5f6d 656d 6f72 795f 6675 6e63 7469 6f6e 3a47 2837 2c31 3129
3056620  002f 7573 722f 6c73 692f 7072 6f64 2f74 6f6f 6c6c 6962 2f69 6e63 6c75 6465 2f68 742e 6800 6874 5f74 6162 6c65 3a74 2838
```

| | | | | | | | | | | | | | | | | | | | | | | | | |
|---|---|---|---|---|---|---|---|---|---|---|---|---|---|---|---|---|---|---|---|---|---|---|---|---|
| 3056700 | 2c31 | 293d | 2a28 | 382c | 3229 | 3d73 | 3468 | 745f | 7461 | 626c | 653a | 2830 | 2c31 | 292c | 302c | 3332 | 3b3b | 0068 | 6173 | 685f | 7461 | 626c | 653a | 7428 |
| 3056760 | 382c | 3129 | 002f | 686f | 6d65 | 2f6f | 7361 | 7331 | 2f61 | 2f61 | 622f | 7372 | 632f | 6e65 | 776f | 626a | 6563 | 7473 | 2f69 | 6e63 | 6c75 | 6465 | 2f6c | 7369 |
| 3057040 | 6770 | 616c | 2e68 | 002f | 686f | 6d65 | 2f6f | 7361 | 7331 | 2f61 | 2f61 | 622f | 7372 | 632f | 6e65 | 776f | 626a | 6563 | 7473 | 2f69 | 6e63 | 6c75 | 6465 | 2f6c |
| 3057120 | 7369 | 6c65 | 782e | 6800 | 2f68 | 6f6d | 652f | 6f73 | 6173 | 312f | 612f | 6162 | 2f73 | 7263 | 2f6e | 6577 | 6f62 | 6a65 | 6374 | 732f | 696e | 636c | 7564 | 652f |
| 3057200 | 6c73 | 696c | 6578 | 2e68 | 006c | 7369 | 6c65 | 7869 | 643a | 5328 | 3130 | 2c31 | 293d | 6172 | 2830 | 2c31 | 293b | 303b | 3635 | 3b28 | 302c | 3229 | 0074 | 7374 |
| 3057260 | 7265 | 616d | 3a74 | 2830 | 2c31 | 3329 | 006c | 6578 | 7265 | 6173 | 6f6e | 3a47 | 2830 | 2c31 | 2900 | 7374 | 724c | 6578 | 3a46 | 2830 | 2c31 | 2900 | 733a | 7028 |
| 3057340 | 302c | 3133 | 2900 | 6b65 | 793a | 7028 | 302c | 3133 | 2900 | 6669 | 7273 | 743a | 7028 | 302c | 3133 | 2900 | 7265 | 7374 | 3a70 | 2830 | 2c31 | 3329 | 0075 | 7469 |
| 3057420 | 6c69 | 7469 | 6573 | 2e63 | 0074 | 7374 | 723a | 2830 | 2c31 | 3329 | 006c | 6578 | 746f | 6b65 | 6e3a | 2830 | 2c31 | 2900 | 4146 | 5445 | 523a | 2830 | 2c31 | 2900 |
| 3057500 | 6c65 | 785f | 6d65 | 615f | 6772 | 703a | 2837 | 2c39 | 2900 | 7965 | 736e | 6f3a | 4628 | 302c | 3133 | 2900 | 7661 | 6c75 | 653a | 7028 | 302c | 3129 | 004e | 4f62 |
| 3057560 | 6a65 | 6374 | 5f64 | 622e | 6f00 | 5f73 | 6574 | 5072 | 6f70 | 5f5f | 374e | 4f62 | 6a65 | 6374 | 4650 | 6366 | 005f | 7365 | 7450 | 726f | 705f | 5f37 | 4e4f | 626a |
| 3057640 | 6563 | 7446 | 5063 | 6900 | 5f67 | 6574 | 4174 | 7472 | 5f5f | 374e | 4f62 | 6a65 | 6374 | 4669 | 005f | 7075 | 745f | 5f37 | 6f73 | 7472 | 6561 | 6d46 | 6300 | 5f73 |
| 3057720 | 6574 | 5072 | 6f70 | 5f5f | 374e | 4f62 | 6a65 | 6374 | 4650 | 6354 | 3100 | 5f65 | 7870 | 6c61 | 696e | 5f5f | 374e | 4f62 | 6a65 | 6374 | 4650 | 6300 | 5f69 | 6f73 |
| 3060000 | 7472 | 6561 | 6d5f | 696e | 6974 | 005f | 6973 | 4c54 | 455f | 5f37 | 4e4f | 626a | 6563 | 7446 | 5036 | 4f62 | 6a65 | 6374 | 005f | 6973 | 4754 | 455f | 5f37 | 4e4f |
| 3060060 | 626a | 6563 | 7446 | 5036 | 4f62 | 6a65 | 6374 | 005f | 6765 | 7450 | 726f | 705f | 5f37 | 4e4f | 626a | 6563 | 7446 | 5063 | 6900 | 5f69 | 6e4f | 7264 | 6572 | 5f5f |
| 3060140 | 364f | 626a | 6563 | 7446 | 5036 | 4f62 | 6a65 | 6374 | 002f | 686f | 6d65 | 2f6f | 7361 | 7331 | 2f61 | 2f61 | 622f | 7372 | 632f | 6e65 | 776f | 626a | 6563 | 7473 |
| 3060220 | 2f61 | 6273 | 2f43 | 2b2b | 2e37 | 3437 | 322f | 004e | 4f62 | 6a65 | 6374 | 5f64 | 622e | 6300 | 4e4f | 626a | 6563 | 745f | 6462 | 2e63 | 7878 | 0069 | 6e74 | 3a74 |
| 3060300 | 2830 | 2c31 | 293d | 7228 | 302c | 3129 | 3b2d | 3231 | 3437 | 3438 | 3336 | 3438 | 3b32 | 3134 | 3734 | 3833 | 3634 | 373b | 0063 | 6861 | 723a | 7428 | 302c | 3229 |
| 3060360 | 3d72 | 2830 | 2c32 | 293b | 303b | 3132 | 373b | 006c | 6f6e | 673a | 7428 | 302c | 3329 | 3d72 | 2830 | 2c31 | 293b | 2d32 | 3134 | 3734 | 3833 | 3634 | 383b | 3231 |
| 3060440 | 3437 | 3438 | 3336 | 3437 | 3b00 | 7368 | 6f72 | 743a | 7428 | 302c | 3429 | 3d72 | 2830 | 2c31 | 293b | 2d33 | 3237 | 3638 | 3b33 | 3237 | 3637 | 3b00 | 756e | 7369 |
| 3060520 | 676e | 6564 | 2063 | 6861 | 723a | 7428 | 302c | 3529 | 3d72 | 2830 | 2c31 | 293b | 303b | 3235 | 353b | 0075 | 6e73 | 6967 | 6e65 | 6420 | 7368 | 6f72 | 743a | 7428 |
| 3060600 | 302c | 3629 | 3d72 | 2830 | 2c31 | 293b | 303b | 3635 | 3533 | 353b | 0075 | 6e73 | 6967 | 6e65 | 6420 | 6c6f | 6e67 | 3a74 | 2830 | 2c37 | 293d | 7228 | 302c | 3129 |
| 3060660 | 3b30 | 3b2d | 313b | 0075 | 6e73 | 6967 | 6e65 | 6420 | 696e | 743a | 7428 | 302c | 3829 | 3d72 | 2830 | 2c31 | 293b | 303b | 2d31 | 3b00 | 666c | 6f61 | 743a | 7428 |
| 3060740 | 302c | 3929 | 3d72 | 2830 | 2c31 | 293b | 343b | 303b | 0064 | 6f75 | 626c | 653a | 7428 | 302c | 3130 | 293d | 7228 | 302c | 3129 | 3b38 | 3b30 | 3b00 | 766f | 6964 |
| 3061020 | 3a74 | 2830 | 2c31 | 3129 | 3d28 | 302c | 3131 | 2900 | 3f3f | 3f3a | 7428 | 302c | 3132 | 293d | 2830 | 2c31 | 2900 | 5f5f | 7670 | 7470 | 3a74 | 2830 | 2c31 | 3329 |
| 3061100 | 3d2a | 2830 | 2c31 | 3429 | 3d66 | 2830 | 2c31 | 2900 | 5f5f | 6d70 | 7472 | 3a54 | 2830 | 2c31 | 3529 | 3d73 | 3864 | 3a28 | 302c | 3429 | 2c30 | 2c31 | 363b | 693a |
| 3061160 | 2830 | 2c34 | 292c | 3136 | 2c31 | 363b | 663a | 2830 | 2c31 | 3329 | 2c33 | 322c | 3332 | 3b3b | 005f | 5046 | 565f | 3a74 | 2830 | 2c31 | 3629 | 3d2a | 2830 | 2c31 |
| 3061240 | 3729 | 3d66 | 2830 | 2c32 | 2900 | 5f50 | 4649 | 5f3a | 7428 | 302c | 3133 | 2900 | 7374 | 7265 | 616d | 706f | 733a | 7428 | 302c | 3129 | 0073 | 7472 | 6561 | 6d6f |
| 3061320 | 6666 | 3a74 | 2830 | 2c31 | 2900 | 696f | 5f73 | 7461 | 7465 | 3a54 | 2830 | 2c31 | 3829 | 3d65 | 676f | 6f64 | 6269 | 745f | 5f69 | 6f5f | 7374 | 6174 | 653a | 302c |
| 3061400 | 656f | 6662 | 6974 | 5f5f | 696f | 5f73 | 7461 | 7465 | 3a31 | 2c66 | 6169 | 6c62 | 6974 | 5f5f | 696f | 5f73 | 7461 | 7465 | 3a32 | 2c62 | 6164 | 6269 | 745f | 5f69 |
| 3061460 | 6f5f | 7374 | 6174 | 653a | 332c | 6861 | 7264 | 6661 | 696c | 5f5f | 696f | 5f73 | 7461 | 7465 | 3a34 | 2c3b | 006f | 7065 | 6e5f | 6d6f | 6465 | 3a54 | 2830 | 2c31 |
| 3061540 | 3929 | 3d65 | 696e | 5f5f | 6f70 | 656e | 5f6d | 6f64 | 653a | 302c | 6f75 | 745f | 5f6f | 7065 | 6e5f | 6d6f | 6465 | 3a31 | 2c61 | 7465 | 5f5f | 6f70 | 656e | 5f6d |
| 3061620 | 6f64 | 653a | 322c | 6170 | 705f | 5f6f | 7065 | 6e5f | 6d6f | 6465 | 3a33 | 2c74 | 7275 | 6e63 | 5f5f | 6f70 | 656e | 5f6d | 6f64 | 653a | 342c | 6e6f | 6372 | 6561 |
| 3061700 | 7465 | 5f5f | 6f70 | 656e | 5f6d | 6f64 | 653a | 352c | 6e6f | 7265 | 706c | 6163 | 655f | 5f6f | 7065 | 6e5f | 6d6f | 6465 | 3a36 | 2c3b | 0073 | 6565 | 6b5f | 6469 |
| 3061760 | 723a | 5428 | 302c | 3230 | 293d | 6562 | 6567 | 5f5f | 7365 | 656b | 5f64 | 6972 | 3a30 | 2c63 | 7572 | 5f5f | 7365 | 656b | 5f64 | 6972 | 3a31 | 2c65 | 6e64 | 5f5f |
| 3062040 | 7365 | 656b | 5f64 | 6972 | 3a32 | 2c3b | 005f | 5f45 | 313a | 5428 | 302c | 3231 | 293d | 6573 | 6b69 | 7077 | 735f | 5f5f | 5f45 | 313a | 302c | 6c65 | 6674 | 5f5f |
| 3062120 | 5f5f | 4531 | 3a31 | 2c72 | 6967 | 6874 | 5f5f | 5f5f | 4531 | 3a32 | 2c69 | 6e74 | 6572 | 6e61 | 6c5f | 5f5f | 5f45 | 313a | 332c | 6465 | 635f | 5f5f | 5f45 | 313a |
| 3062200 | 342c | 6f63 | 745f | 5f5f | 5f45 | 313a | 352c | 6865 | 785f | 5f5f | 5f45 | 313a | 362c | 7368 | 6f77 | 6261 | 7365 | 5f5f | 5f5f | 4531 | 3a37 | 2c5c | 0073 | 686f |
| 3062260 | 7770 | 6f69 | 6e74 | 5f5f | 5f5f | 4531 | 3a38 | 2c75 | 7070 | 6572 | 6361 | 7365 | 5f5f | 5f5f | 4531 | 3a39 | 2c73 | 686f | 7770 | 6f73 | 5f5f | 5f5f | 4531 | 3a31 |
| 3062340 | 302c | 7363 | 6965 | 6e74 | 6966 | 6963 | 5f5f | 5f5f | 4531 | 3a31 | 312c | 6669 | 7865 | 645f | 5f5f | 5f45 | 313a | 3132 | 2c75 | 6e69 | 7462 | 7566 | 5f5f | 5f5f |
| 3062420 | 4531 | 3a31 | 332c | 7374 | 6469 | 6f5f | 5f5f | 5f45 | 313a | 3134 | 2c3b | 005f | 5f45 | 323a | 5428 | 302c | 3232 | 293d | 6573 | 6b69 | 7070 | 696e | 675f | 5f5f |
| 3062500 | 5f45 | 323a | 302c | 7469 | 6564 | 5f5f | 5f5f | 4532 | 3a31 | 2c3b | 0069 | 6f73 | 3a54 | 2830 | 2c32 | 3329 | 3d73 | 3630 | 6e75 | 7365 | 725f | 5f33 | 696f | 733a |
| 3062560 | 2830 | 2c31 | 292c | 302c | 3332 | 3b78 | 5f75 | 7365 | 725f | 5f33 | 696f | 733a | 2830 | 2c32 | 3729 | 3d2a | 2830 | 2c32 | 3429 | 3d78 | 7569 | 6f73 | 5f75 | 7365 |
| 3062640 | 725f | 756e | 696f | 6e3a | 2c33 | 322c | 3332 | 3b62 | 705f | 5f33 | 696f | 733a | 2830 | 2c32 | 3829 | 3d2a | 2830 | 2c32 | 3529 | 3d78 | 7373 | 7472 | 6561 | 6d62 |
| 3062720 | 7566 | 3a2c | 3634 | 2c33 | 323b | 7374 | 6174 | 655f | 5f33 | 696f | 733a | 2830 | 2c31 | 292c | 3936 | 2c33 | 323b | 6973 | 7065 | 6369 | 616c | 5f5f | 3369 | 6f73 |
| 3063000 | 3a28 | 302c | 3129 | 2c31 | 3238 | 2c33 | 323b | 6f73 | 7065 | 6369 | 616c | 5f5f | 3369 | 6f73 | 3a28 | 302c | 3129 | 2c31 | 3630 | 2c33 | 323b | 6973 | 6678 | 5f73 |
| 3063060 | 7065 | 6369 | 616c | 5f5f | 3369 | 6f73 | 3a28 | 302c | 3129 | 2c31 | 3932 | 2c33 | 323b | 6f73 | 6678 | 5f73 | 7065 | 6369 | 616c | 5f5f | 3369 | 6f73 | 3a28 | 302c |
| 3063140 | 3129 | 2c32 | 3234 | 2c33 | 323b | 5c00 | 6465 | 6c62 | 7566 | 5f5f | 3369 | 6f73 | 3a28 | 302c | 3129 | 2c32 | 3536 | 2c33 | 323b | 785f | 7469 | 655f | 5f33 | 696f |
| 3063220 | 733a | 2830 | 2c32 | 3929 | 3d2a | 2830 | 2c32 | 3629 | 3d78 | 736f | 7374 | 7265 | 616d | 3a2c | 3238 | 382c | 3332 | 3b78 | 5f66 | 6c61 | 6773 | 5f5f | 3369 | 6f73 |
| 3063300 | 3a28 | 302c | 3129 | 2c33 | 3230 | 2c33 | 323b | 785f | 7072 | 6563 | 6973 | 696f | 6e5f | 5f33 | 696f | 733a | 2830 | 2c34 | 292c | 3335 | 322c | 3136 | 3b78 | 5f66 |
| 3063360 | 696c | 6c5f | 5f33 | 696f | 733a | 2830 | 2c32 | 292c | 3336 | 382c | 383b | 785f | 7769 | 6474 | 685f | 5f33 | 696f | 733a | 2830 | 2c34 | 292c | 3338 | 342c | 3136 |
| 3063440 | 3b61 | 7373 | 6967 | 6e5f | 7072 | 6976 | 6174 | 655f | 5f33 | 696f | 733a | 2830 | 2c31 | 292c | 3431 | 362c | 3332 | 3b5f | 5f76 | 7074 | 725f | 5f33 | 696f | 733a |
| 3063520 | 2830 | 2c33 | 3029 | 3d2a | 2830 | 2c31 | 3529 | 2c34 | 3438 | 2c33 | 323b | 3b00 | 6261 | 7365 | 6669 | 656c | 645f | 5f33 | 696f | 733a | 4728 | 302c | 3129 | 0061 |
| 3063600 | 646a | 7573 | 7466 | 6965 | 6c64 | 5f5f | 3369 | 6f73 | 3a47 | 2830 | 2c31 | 2900 | 666c | 6f61 | 7466 | 6965 | 6c64 | 5f5f | 3369 | 6f73 | 3a47 | 2830 | 2c31 | 2900 |
| 3063660 | 6e65 | 7874 | 6269 | 745f | 5f33 | 696f | 733a | 4728 | 302c | 3129 | 006e | 6578 | 7477 | 6f72 | 645f | 5f33 | 696f | 733a | 4728 | 302c | 3129 | 0073 | 7464 | 696f |
| 3063740 | 666c | 7573 | 685f | 5f33 | 696f | 733a | 4728 | 302c | 3136 | 2900 | 696f | 733a | 5a63 | 696f | 733b | 3b5f | 5f63 | 745f | 5f33 | 696f | 7346 | 5039 | 7374 | 7265 |

```
3064020 616d 6275 6620 5f5f 6374 5f5f 3369 6f73 4676 205f 5f63 745f 5f33 696f 7346 5233 696f 7320 5f5f 6474 5f5f 3369 6f73 4676
3064100 2066 6c61 6773 5f5f 3369 6f73 4676 2066 6c61 6773 5f5f 3369 6f73 466c 2073 6574 665f 5f33 696f 7346 6c54 3120 7365 7466
3064160 5f5f 3369 6f73 466c 2075 6e73 6574 665f 5f33 696f 7346 6c20 7769 6474 685f 5f33 696f 7346 7620 7769 6474 685f 5f33 696f
3064240 7346 6920 7469 655f 5f33 696f 7346 5037 6f73 7472 6561 6d20 5c00 7469 655f 5f33 696f 7346 7620 6669 6c6c 5f5f 3369 6f73
3064320 4663 2066 696c 6c5f 5f33 696f 7346 7620 7072 6563 6973 696f 6e5f 5f33 696f 7346 6920 7072 6563 6973 696f 6e5f 5f33 696f
3064400 7346 7620 7264 7374 6174 655f 5f33 696f 7346 7620 5f5f 6f70 5076 5f5f 3369 6f73 4676 205f 5f6e 745f 5f33 696f 7346 7620
3064460 656f 665f 5f33 696f 7346 7620 6661 696c 5f5f 3369 6f73 4675 2062 6164 5f5f 3369 6f73 4676 2067 6f6f 645f 5f33 696f 7346
3064540 7620 636c 6561 725f 5f33 696f 7346 6920 7264 6275 665f 5f33 696f 7346 7620 5c00 6977 6f72 645f 5f33 696f 7346 6920 7077
3064620 6f72 645f 5f33 696f 7346 6920 6269 7461 6c6c 6f63 5f5f 3369 6f73 5346 7620 7861 6c6c 6f63 5f5f 3369 6f73 5346 7620 7572
3064700 6573 697a 655f 5f33 696f 7346 6920 7379 6e63 5f77 6974 685f 7374 6469 6f5f 5f33 696f 7353 4676 2073 6574 7374 6174 655f
3064760 5f33 696f 7346 6920 696e 6974 5f5f 3369 6f73 4650 3973 7472 6561 6d62 7566 205f 5f61 735f 5f33 696f 7346 5233 696f 7320
3065040 736b 6970 5f5f 3369 6f73 4669 203b 6261 7365 6669 656c 645f 5f33 696f 7320 5c00 6164 6a75 7374 6669 656c 645f 5f33 696f
3065120 7320 666c 6f61 7466 6965 6c64 5f5f 3369 6f73 206e 6578 7462 6974 5f5f 3369 6f73 206e 6578 7477 6f72 645f 5f33 696f 7320
3065200 7374 6469 6f66 6c75 7368 5f5f 3369 6f73 203b 3b00 7374 7265 616d 6275 663a 5428 302c 3235 293d 7334 3061 6c6c 6f63 5f5f
3065260 3973 7472 6561 6d62 7566 3a28 302c 3429 2c30 2c31 363b 785f 756e 6275 665f 5f39 7374 7265 616d 6275 663a 2830 2c34 292c
3065340 3136 2c31 363b 785f 6261 7365 5f5f 3973 7472 6561 6d62 7566 3a28 302c 3331 293d 2a28 302c 3229 2c33 322c 3332 3b78 5f70
3065420 6261 7365 5f5f 3973 7472 6561 6d62 7566 3a28 302c 3331 292c 3634 2c33 323b 785f 7070 7472 5f5f 3973 7472 6561 6d62 7566
3065500 3a28 302c 3331 292c 3936 2c33 323b 785f 6570 7074 725f 5f39 7374 7265 616d 6275 663a 2830 2c33 3129 2c31 3238 2c33 323b
3065560 785f 6770 7472 5f5f 3973 7472 6561 6d62 7566 3a28 302c 3331 292c 3136 302c 3332 3b78 5f65 6770 7472 5f5f 3973 7472 6561
3065640 6d62 7566 3a28 302c 3331 292c 3139 322c 3332 3b5c 0078 5f65 6261 636b 5f5f 3973 7472 6561 6d62 7566 3a28 302c 3331 292c
3065720 3232 342c 3332 3b78 5f62 6c65 6e5f 5f39 7374 7265 616d 6275 663a 2830 2c31 292c 3235 362c 3332 3b5f 5f76 7074 725f 5f39
3066000 7374 7265 616d 6275 663a 2830 2c33 3029 2c32 3838 2c33 323b 3b00 7374 7265 616d 6275 663a 5a63 7374 7265 616d 6275 663b
3066060 3b5f 5f63 745f 5f39 7374 7265 616d 6275 6646 5239 7374 7265 616d 6275 6620 5f5f 6374 5f5f 3973 7472 6561 6d62 7566 4676
3066140 205f 5f63 745f 5f39 7374 7265 616d 6275 6646 5063 6920 5f5f 6374 5f5f 3973 7472 6561 6d62 7566 4650 6369 5432 205f 5f61
3066220 735f 5f39 7374 7265 616d 6275 6646 5239 7374 7265 616d 6275 6620 6462 705f 5f39 7374 7265 616d 6275 6646 7620 6261 7365
3066300 5f5f 3973 7472 6561 6d62 7566 4676 2070 6261 7365 5f5f 3973 7472 6561 6d62 7566 4676 205c 0070 7074 725f 5f39 7374 7265
3066360 616d 6275 6646 7620 6570 7074 725f 5f39 7374 7265 616d 6275 6646 7620 6770 7472 5f5f 3973 7472 6561 6d62 7566 4676 2065
3066440 6770 7472 5f5f 3973 7472 6561 6d62 7566 4676 2065 6261 636b 5f5f 3973 7472 6561 6d62 7566 4676 2065 6275 665f 5f39 7374
3066520 7265 616d 6275 6646 7620 626c 656e 5f5f 3973 7472 6561 6d62 7566 4676 2073 6574 705f 5f39 7374 7265 616d 6275 6646 5063
3066600 5431 2073 6574 675f 5f39 7374 7265 616d 6275 6646 5063 4e32 3120 7062 756d 705f 5f39 7374 7265 616d 6275 6646 6920 5c00
3066660 6762 756d 705f 5f39 7374 7265 616d 6275 6646 6920 7365 7462 5f5f 3973 7472 6561 6d62 7566 4650 6354 3169 2075 6e62 7566
3066740 6665 7265 645f 5f39 7374 7265 616d 6275 6646 7620 756e 6275 6666 6572 6564 5f5f 3973 7472 6561 6d62 7566 4669 2061 6c6c
3067020 6f63 6174 655f 5f39 7374 7265 616d 6275 6646 7620 646f 616c 6c6f 6361 7465 5f5f 3973 7472 6561 6d62 7566 4676 206f 7665
3067100 7266 6c6f 775f 5f39 7374 7265 616d 6275 6646 6920 756e 6465 7266 6c6f 775f 5f39 7374 7265 616d 6275 6646 7620 5c00 7062
3067160 6163 6b66 6169 6c5f 5f39 7374 7265 616d 6275 6646 6920 7379 6e63 5f5f 3973 7472 6561 6d62 7566 4676 2073 6565 6b6f 6666
3067240 5f5f 3973 7472 6561 6d62 7566 466c 3873 6565 6b5f 6469 7269 2073 6565 6b70 6f73 5f5f 3973 7472 6561 6d62 7566 466c 6920
3067320 7873 7075 746e 5f5f 3973 7472 6561 6d62 7566 4650 4363 6920 7873 6765 746e 5f5f 3973 7472 6561 6d62 7566 4650 6369 2069
3067400 6e5f 6176 6169 6c5f 5f39 7374 7265 616d 6275 6646 7620 6f75 745f 7761 6974 696e 675f 5f39 7374 7265 616d 6275 6646 7620
3067460 5c00 7367 6574 635f 5f39 7374 7265 616d 6275 6646 7620 736e 6578 7463 5f5f 3973 7472 6561 6d62 7566 4676 2073 6275 6d70
3067540 635f 5f39 7374 7265 616d 6275 6646 7620 7374 6f73 7363 5f5f 3973 7472 6561 6d62 7566 4676 2073 7075 7462 6163 6b63 5f5f
3067620 3973 7472 6561 6d62 7566 4663 2073 7075 7463 5f5f 3973 7472 6561 6d62 7566 4669 2073 7075 746e 5f5f 3973 7472 6561 6d62
3067700 7566 4650 4363 6920 7367 6574 6e5f 5f39 7374 7265 616d 6275 6646 5063 6920 7365 7462 7566 5f5f 3973 7472 6561 6d62 7566
3067760 4650 6369 205c 0073 6574 6275 665f 5f39 7374 7265 616d 6275 6646 5055 6369 2073 6574 6275 665f 5f39 7374 7265 616d 6275
3070040 6646 5063 6954 3220 5f5f 6474 5f5f 3973 7472 6561 6d62 7566 4676 2078 5f73 6e65 7874 635f 5f39 7374 7265 616d 6275 6646
3070120 7620 3b3b 3b00 6973 7472 6561 6d3a 5428 302c 3332 293d 7337 3278 5f67 636f 756e 745f 5f37 6973 7472 6561 6d3a 2830 2c31
3070200 292c 302c 3332 3b5f 5f76 7074 725f 5f37 6973 7472 6561 6d3a 2830 2c33 3029 2c33 322c 3332 3b50 696f 733a 2830 2c33 3329
3070260 3d2a 2830 2c32 3329 2c36 342c 3332 3b4f 696f 733a 2830 2c32 3329 2c39 362c 3438 303b 3b00 6973 7472 6561 6d3a 5a63 6973
3070340 7472 6561 6d3b 695f 733b 5f5f 6374 5f5f 3769 7374 7265 616d 4650 3973 7472 6561 6d62 7566 205f 5f63 745f 5f37 6973 7472
3070420 6561 6d46 7620 5f5f 6374 5f5f 3769 7374 7265 616d 4650 3973 7472 6561 6d62 7566 6950 376f 7374 7265 616d 205f 5f63 745f
3070500 5f37 6973 7472 6561 6d46 6950 6354 3120 5f5f 6374 5f5f 3769 7374 7265 616d 4669 5431 5037 6f73 7472 6561 6d20 5f5f 6374
3070560 5f5f 3769 7374 7265 616d 4652 3769 7374 7265 616d 205f 5f64 745f 5f37 6973 7472 6561 6d46 7620 5c00 6970 6678 5f5f 3769
3070640 7374 7265 616d 4669 2069 7366 785f 5f37 6973 7472 6561 6d46 7620 7365 656b 675f 5f37 6973 7472 6561 6d46 6c20 7365 656b
3070720 675f 5f37 6973 7472 6561 6d46 6c38 7365 656b 5f64 6972 2074 656c 6c67 5f5f 3769 7374 7265 616d 4676 205f 5f72 735f 5f37
3071000 6973 7472 6561 6146 5046 5237 6973 7472 6561 645f 5237 6973 7472 6561 6d20 5f5f 7273 5f5f 3769 7374 7265 616d 4650 4652
3071060 3369 6f73 5f52 3369 6f73 205f 5f72 735f 5f37 6973 7472 6561 6d46 5063 205f 5f72 735f 5f37 6973 7472 6561 6d46 5055 6320
```

```
3071140 5c00 5f5f 7273 5f5f 3769 7374 7265 616d 4652 5563 205f 5f72 735f 5f37 6973 7472 6561 6d46 5263 205f 5f72 735f 5f37 6973
3071220 7472 6561 6d46 5273 205f 5f72 735f 5f37 6973 7472 6561 6d46 5269 205f 5f72 735f 5f37 6973 7472 6561 6d46 526c 205f 5f72
3071300 735f 5f37 6973 7472 6561 6d46 5255 7320 5f5f 7273 5f5f 3769 7374 7265 616d 4652 5569 205f 5f72 735f 5f37 6973 7472 6561
3071360 6d46 5255 6c20 5f5f 7273 5f5f 3769 7374 7265 616d 4652 6620 5f5f 7273 5f5f 3769 7374 7265 616d 4652 6420 5f5f 7273 5f5f
3071440 3769 7374 7265 616d 4650 3973 7472 6561 6d62 7566 205c 0067 6574 5f5f 3769 7374 7265 616d 4650 6369 6320 6765 745f 5f37
3071520 6973 7472 6561 6d46 5055 6369 6320 6765 745f 5f37 6973 7472 6561 6d46 5239 7374 7265 616d 6275 6663 2067 6574 5f5f 3769
3071600 7374 7265 616d 4652 5563 2067 6574 5f5f 3769 7374 7265 616d 4652 6320 6765 745f 5f37 6973 7472 6561 6d46 7620 6765 746c
3071660 696e 655f 5f37 6973 7472 6561 6d46 5063 6963 2067 6574 6c69 6e65 5f5f 3769 7374 7265 616d 4650 5563 6963 2070 6565 6b5f
3071740 5f37 6973 7472 6561 6d46 7620 6967 6e6f 7265 5f5f 3769 7374 7265 616d 4669 5431 205c 0072 6561 645f 5f37 6973 7472 6561
3072020 6d46 5063 6920 7265 6164 5f5f 3769 7374 7265 616d 4650 5563 6920 6763 6f75 6e74 5f5f 3769 7374 7265 616d 4676 2070 7574
3072100 6261 636b 5f5f 3769 7374 7265 616d 4663 2073 796e 635f 5f37 6973 7472 6561 6d46 7620 646f 5f69 7066 785f 5f37 6973 7472
3072160 6561 6d46 6920 6561 7477 6869 7465 5f5f 3769 7374 7265 616d 4676 2078 6765 745f 5f37 6973 7472 6561 6d46 5063 203b 3b3b
3072240 006f 7374 7265 616d 3a54 2830 2c32 3629 3d73 3639 5f5f 7670 7472 5f5f 376f 7374 7265 616d 3a28 302c 3330 292c 302c 3332
3072320 3b50 696f 733a 2830 2c33 3329 2c33 322c 3332 3b4f 696f 733a 2830 2c32 3329 2c36 342c 3438 303b 3b00 6f73 7472 6561 6d3a
3072400 5a63 6f73 7472 6561 6d3b 696f 733b 5f5f 6374 5f5f 376f 7374 7265 616d 4650 3973 7472 6561 6d62 7566 205f 5f63 745f 5f37
3072460 6f73 7472 6561 6d46 7620 5f5f 6374 5f5f 376f 7374 7265 616d 4669 205f 5f63 745f 5f37 6f73 7472 6561 6d46 6950 6320 5f5f
3072540 6374 5f5f 376f 7374 7265 616d 4652 376f 7374 7265 616d 205f 5f64 745f 5f37 6f73 7472 6561 6d46 7620 6f70 6678 5f5f 376f
3072620 7374 7265 616d 4676 206f 7366 785f 5f37 6f73 7472 6561 6d46 7620 666c 7573 685f 5f37 6f73 7472 6561 6d46 7620 5c00 7365
3072700 656b 705f 5f37 6f73 7472 6561 6d46 6c20 7365 656b 705f 5f37 6f73 7472 6561 6d46 6c38 7365 656b 5f64 6972 2074 656c 6c70
3072760 5f5f 376f 7374 7265 616d 4676 2070 7574 5f5f 376f 7374 7265 616d 4663 205f 5f6c 735f 5f37 6f73 7472 6561 6d46 6320 5f5f
3073040 6c73 5f5f 376f 7374 7265 616d 4655 6320 5f5f 6c73 5f5f 376f 7374 7265 616d 4650 4363 205f 5f6c 735f 5f37 6f73 7472 6561
3073120 6d46 6920 5f5f 6c73 5f5f 376f 7374 7265 616d 466c 205f 5f6c 735f 5f37 6f73 7472 6561 6d46 6420 5f5f 6c73 5f5f 376f 7374
3073200 7265 616d 4666 205c 005f 5f6c 735f 5f37 6f73 7472 6561 6d46 5569 205f 5f6c 735f 5f37 6f73 7472 6561 6d46 556c 205f 5f6c
3073260 735f 5f37 6f73 7472 6561 6d46 5076 205f 5f6c 735f 5f37 6f73 7472 6561 6d46 5039 7374 7265 616d 6275 6620 5f5f 6c73 5f5f
3073340 376f 7374 7265 616d 4673 205f 5f6c 735f 5f37 6f73 7472 6561 6d46 5573 205f 5f6c 735f 5f37 6f73 7472 6561 6d46 5046 5237
3073420 6f73 7472 6561 6d5f 5237 6f73 7472 6561 6d20 5f5f 6c73 5f5f 376f 7374 7265 616d 4650 4652 3369 6f73 5f52 3369 6f73 2077
3073500 7269 7465 5f5f 376f 7374 7265 616d 4650 4363 6920 5c00 7772 6974 655f 5f37 6f73 7472 6561 6d46 5043 5563 6920 646f 5f6f
3073560 7066 785f 5f37 6f73 7472 6561 6d46 7620 646f 5f6f 7366 785f 5f37 6f73 7472 6561 6d46 7620 3b3b 3b00 7075 745f 5f37 6f73
3073640 7472 6561 6d46 633a 6628 302c 3334 293d 2a28 302c 3236 2900 5f5f 3074 6869 733a 7028 302c 3334 2900 5f5f 3063 3a70 2830
3073720 2c32 2900 2f75 7372 2f43 432f 7375 6e34 2f69 6e63 6c2f 696f 7374 7265 616d 2e68 005f 5f30 7468 6973 3a72 2830 2c33 3429
3074000 005f 5f30 7468 6973 203a 5a74 6c00 5f5f 3063 203a 5a74 6c00 7075 745f 5f37 6f73 7472 6561 6d46 6320 3a5a 7446 0069 6f73
3074060 7472 6561 6d3a 5428 302c 3335 293d 7338 3078 5f67 636f 756e 745f 5f37 6973 7472 6561 6d3a 2930 2c31 292c 302c 3332 3b5f
3074140 5f76 7074 725f 5f37 6973 7472 6561 6d3a 2830 2c33 3029 2c33 322c 3332 3b50 696f 733a 2830 2c33 3329 2c36 342c 3332 3b4f
3074220 6f73 7472 6561 6d3a 2830 2c32 3629 2c39 362c 3534 343b 3b00 696f 7374 7265 616d 3a5a 6369 6f73 7472 6561 6d3b 6973 7472
3074300 6561 6d20 6f73 7472 6561 6d20 696f 733b 5f5f 6374 5f5f 3869 6f73 7472 6561 6d46 5039 7374 7265 616d 6275 6620 5f5f 6374
3074360 5f5f 3869 6f73 7472 6561 6d46 7620 5f5f 6374 5f5f 3869 6f73 7472 6561 6d46 5238 696f 7374 7265 616d 205f 5f64 745f 5f38
3074440 696f 7374 7265 616d 4676 203b 3b3b 0063 696e 3a47 2830 2c33 3629 3d78 7369 7374 7265 616d 5f77 6974 6861 7373 6967 6c3a
3074520 0063 6f75 743a 4728 302c 3337 293d 7873 6f73 7472 6561 6d5f 7769 7468 6173 7369 676e 3a00 6365 7272 3a47 2830 2c33 3729
3074600 0063 6c6f 673a 4728 302c 3337 2900 496f 7374 7265 616d 5f69 6e69 743a 5428 302c 3338 293d 7331 5f5f 5739 5f5f 3133 496f
3074660 7374 7265 616d 5f69 6e69 743a 2830 2c32 292c 302c 383b 3b00 7374 6473 7461 7475 735f 5f31 3349 6f73 7472 6561 6d5f 696e
3074740 6974 3a47 2830 2c31 2900 696e 6974 636f 756e 745f 5f31 3349 6f73 7472 6561 6d5f 696e 6974 3a47 2830 2c31 2900 496f 7374
3075020 7265 616d 5f69 6e69 743a 5a63 496f 7374 7265 616d 5f69 6e69 743b 3b5f 5f63 745f 5f31 3349 6f73 7472 6561 6d5f 696e 6974
3075100 4676 205f 5f64 745f 5f31 3349 6f73 7472 6561 6d5f 696e 6974 4676 203b 7374 6473 7461 7475 735f 5f31 3349 6f73 7472 6561
3075160 6d5f 696e 6974 2069 6e69 7463 6f75 6e74 5f5f 3133 496f 7374 7265 616d 5f69 6e69 7420 3b40 696f 733b 0069 6f73 7472 6561
3075240 6d5f 696e 6974 3a53 2830 2c33 3029 0047 5054 3a74 2830 2c31 3329 0073 6d61 6e69 705f 696e 743a 5428 302c 3339 293d 7338
3075320 6663 745f 5f31 3073 6d61 6e69 705f 696e 743a 2830 2c34 3029 3a2a 2830 2c34 3129 3d66 2830 2c33 3329 2c30 2c33 323b 6172
3075400 675f 5f31 3073 6d61 6e69 705f 696e 743a 2830 2c31 292c 3332 2c33 323b 3b00 736d 616e 6970 5f69 6e74 3a5a 6373 6d61 6e69
3075460 705f 696e 743b 3b5f 5f63 745f 5f31 3073 6d61 6e69 705f 696e 7446 5046 5233 696f 7369 5f52 3369 6f73 6920 3b3b 5f5f 6c73
3075540 5f5f 4652 376f 7374 7265 616d 5231 3073 6d61 6e69 705f 696e 7420 5f5f 7273 5f5f 4652 3769 7374 7265 616d 5231 3073 6d61
3075620 6e69 705f 696e 7420 3b00 7361 7070 6c79 5f69 6e74 3a54 2830 2c34 3229 3d73 3466 6374 5f5f 3130 7361 7070 6c79 5f69 6e74
3075700 3a28 302c 3430 292c 302c 3332 3b3b 0073 6170 706c 795f 696e 743a 5a63 7361 7070 6c79 5f69 6e74 3b3b 5f5f 6374 5f5f 3130
3075760 7361 7070 6c79 5f69 6e74 4650 4652 3369 6f73 695f 5233 696f 7320 5f5f 636c 5f5f 3130 7361 7070 6c79 5f69 6e74 4669 203b
3076040 3b3b 0069 6d61 6e69 705f 696e 743a 5428 302c 3433 293d 7338 6663 745f 5f31 3069 6d61 6e69 705f 696e 743a 2830 2c34 3429
3076120 3d2a 2830 2c34 3529 3d66 2830 2c34 3629 3d2a 2830 2c33 3229 2c30 2c33 323b 6172 675f 5f31 3969 6d61 6e69 705f 696e 743a
3076200 2830 2c31 292c 3332 2c33 323b 3b00 696d 616e 6970 5f69 6e74 3a5a 6369 6d61 6e69 705f 696e 743b 3b5f 5f63 745f 5f31 3069
```

| | | | | | | | | | | | | | | | | | | | | | | | | |
|---|---|---|---|---|---|---|---|---|---|---|---|---|---|---|---|---|---|---|---|---|---|---|---|---|
| 3076260 | 6d61 | 6e69 | 705f | 696e | 7446 | 5046 | 5237 | 6973 | 7472 | 6561 | 6d69 | 5f52 | 3769 | 7374 | 7265 | 616d | 6920 | 3b3b | 5f5f | 7273 | 5f5f | 4652 | 3769 | 7374 |
| 3076340 | 7265 | 616d | 5231 | 3069 | 6d61 | 6e69 | 705f | 696e | 7420 | 3b00 | 6961 | 7070 | 6c79 | 5f69 | 6e74 | 3a54 | 2830 | 2c34 | 3729 | 3d73 | 3466 | 6374 | 5f5f | 3130 |
| 3076420 | 6961 | 7070 | 6c79 | 5f69 | 6e74 | 3a28 | 302c | 3434 | 292c | 302c | 3332 | 3b3b | 0069 | 6170 | 706c | 795f | 696e | 743a | 5a63 | 6961 | 7070 | 6c79 | 5f69 | 6e74 |
| 3076500 | 3b3b | 5f5f | 6374 | 5f5f | 3130 | 6961 | 7070 | 6c79 | 5f69 | 6e74 | 4650 | 4652 | 3769 | 7374 | 7265 | 616d | 695f | 5237 | 6973 | 7472 | 6561 | 6d20 | 5f5f | 636c |
| 3076560 | 5f5f | 3130 | 6961 | 7070 | 6c79 | 5f69 | 6e74 | 4669 | 203b | 3b3b | 006f | 6d61 | 6e69 | 705f | 696e | 743a | 5428 | 302c | 3438 | 293d | 7338 | 6663 | 745f | 5f31 |
| 3076640 | 306f | 6d61 | 6e69 | 705f | 696e | 743a | 2830 | 2c34 | 3929 | 3d2a | 2830 | 2c35 | 3029 | 3d66 | 2830 | 2c33 | 3429 | 2c30 | 2c33 | 323b | 6172 | 675f | 5f31 | 306f |
| 3076720 | 6d61 | 6e69 | 705f | 696e | 743a | 2830 | 2c31 | 292c | 3332 | 2c33 | 323b | 3b00 | 6f6d | 616e | 6970 | 5f69 | 6e74 | 3a5a | 636f | 6d61 | 6e69 | 705f | 696e | 743b |
| 3077000 | 3b5f | 5f63 | 745f | 5f31 | 306f | 6d61 | 6e69 | 705f | 696e | 7446 | 5046 | 5237 | 6f73 | 7472 | 6561 | 6d69 | 5f52 | 376f | 7374 | 7265 | 616d | 6920 | 3b3b | 5f5f |
| 3077060 | 6c73 | 5f5f | 4652 | 376f | 7374 | 7265 | 616d | 5231 | 306f | 6d61 | 6e69 | 705f | 696e | 7420 | 3b00 | 6f61 | 7070 | 6c79 | 5f69 | 6e74 | 3a54 | 2830 | 2c35 | 3129 |
| 3077140 | 3d73 | 3466 | 6374 | 5f5f | 3130 | 6f61 | 7070 | 6c79 | 5f69 | 6e74 | 3a28 | 302c | 3439 | 292c | 302c | 3332 | 3b3b | 006f | 6170 | 706c | 795f | 696e | 743a | 5a63 |
| 3077220 | 6f61 | 7070 | 6c79 | 5f69 | 6e74 | 3b3b | 5f5f | 6374 | 5f5f | 3130 | 6f61 | 7070 | 6c79 | 5f69 | 6e74 | 4650 | 4652 | 376f | 7374 | 7265 | 616d | 695f | 5237 | 6f73 |
| 3077300 | 7472 | 6561 | 6d20 | 5f5f | 636c | 5f5f | 3130 | 6f61 | 7070 | 6c79 | 5f69 | 6e74 | 4669 | 203b | 3b3b | 0069 | 6f6d | 616e | 6970 | 5f69 | 6e74 | 3a54 | 2830 | 2c35 |
| 3077360 | 3229 | 3d73 | 3866 | 6374 | 5f5f | 3131 | 696f | 6d61 | 6e69 | 705f | 696e | 743a | 2830 | 2c35 | 3329 | 3d2a | 2830 | 2c35 | 3429 | 3d66 | 2830 | 2c35 | 3529 | 3d2a |
| 3077440 | 2830 | 2c33 | 3529 | 2c30 | 2c33 | 323b | 6172 | 675f | 5f31 | 3169 | 6f6d | 516e | 6970 | 5f69 | 6e74 | 3a28 | 302c | 3129 | 2c33 | 322c | 3332 | 3b3b | 0069 | 6f6d |
| 3077520 | 616e | 6970 | 5f69 | 6e74 | 3a5a | 6369 | 6f6d | 616e | 6970 | 5f69 | 6e74 | 3b3b | 5f5f | 6374 | 5f5f | 3131 | 695f | 6d61 | 6e69 | 705f | 696e | 7446 | 5046 | 5238 |
| 3077600 | 696f | 7374 | 7265 | 616d | 695f | 5238 | 696f | 7374 | 7265 | 616d | 6920 | 3b3b | 5f5f | 6c73 | 5f5f | 4652 | 3869 | 6f73 | 7472 | 6561 | 6d52 | 3131 | 696f | 6d61 |
| 3077660 | 6e69 | 705f | 696e | 7420 | 5f5f | 7273 | 5f5f | 4652 | 3869 | 6f73 | 7472 | 6561 | 6d52 | 3131 | 696f | 6d61 | 6e69 | 705f | 696e | 7420 | 3b00 | 696f | 6170 | 706c |
| 3077740 | 795f | 696e | 743a | 5428 | 302c | 3536 | 293d | 7334 | 6663 | 745f | 5f31 | 3169 | 6f61 | 7070 | 6c79 | 5f69 | 6e74 | 3a28 | 302c | 3533 | 292c | 302c | 3332 | 3b3b |
| 3100020 | 0069 | 6f61 | 7070 | 6c79 | 5f69 | 6e74 | 3a5a | 6369 | 6f61 | 7070 | 6c79 | 5f69 | 6e74 | 3b3b | 5f5f | 6374 | 5f5f | 3131 | 696f | 6170 | 706c | 795f | 696e | 7446 |
| 3100100 | 5046 | 5238 | 696f | 7374 | 7265 | 616d | 695f | 5238 | 696f | 7374 | 7265 | 616d | 205f | 5f63 | 6c5f | 5f31 | 3169 | 6f61 | 7070 | 6c79 | 5f69 | 6e74 | 4669 | 203b |
| 3100160 | 3b3b | 0073 | 6d61 | 6e69 | 705f | 6c6f | 6e67 | 3a54 | 2830 | 2c35 | 3729 | 3d73 | 3966 | 6374 | 5f5f | 3131 | 736d | 616e | 6970 | 5f6c | 6f6e | 673a | 2830 | 2c34 |
| 3100240 | 3029 | 2c30 | 2c33 | 323b | 6172 | 675f | 5f31 | 3173 | 6d61 | 6e69 | 705f | 6c6f | 6e67 | 3a28 | 302c | 3129 | 2c33 | 322c | 3332 | 3b3b | 0073 | 6d61 | 6e69 | 705f |
| 3100320 | 6c6f | 6e67 | 3a5a | 6373 | 6d61 | 6e69 | 705f | 6c6f | 6e67 | 3b3b | 5f5f | 6374 | 5f5f | 3131 | 736d | 616e | 6970 | 5f6c | 6f6e | 6746 | 5046 | 5233 | 696f | 736c |
| 3100400 | 5f52 | 3369 | 6f73 | 6c20 | 3b3b | 5f5f | 6c73 | 5f5f | 4652 | 376f | 7374 | 7265 | 616d | 5231 | 3173 | 6d61 | 6e69 | 705f | 6c6f | 6e67 | 205f | 5f72 | 735f | 5f46 |
| 3100460 | 5237 | 6973 | 7472 | 6561 | 6d52 | 3131 | 736d | 616e | 6970 | 5f6c | 6f6e | 6720 | 3b00 | 7361 | 7070 | 6c79 | 5f6c | 6f6e | 673a | 5428 | 302c | 3538 | 293d | 7334 |
| 3100540 | 6663 | 745f | 5f31 | 3173 | 6170 | 706c | 795f | 6c6f | 6e67 | 3a28 | 302c | 3430 | 292c | 302c | 3332 | 3b3b | 0073 | 6170 | 706c | 795f | 6c6f | 6e67 | 3a5a | 6373 |
| 3100620 | 6170 | 706c | 795f | 6c6f | 6e67 | 3b3b | 5f5f | 6374 | 5f5f | 3131 | 7361 | 7070 | 6c79 | 5f6c | 6f6e | 6746 | 5046 | 5233 | 696f | 736c | 5f52 | 3369 | 6f73 | 205f |
| 3100700 | 5f63 | 6c5f | 5f31 | 3173 | 6170 | 706c | 795f | 6c6f | 6e67 | 466c | 203b | 3b3b | 0069 | 6d61 | 6e69 | 705f | 6c6f | 6e67 | 3a54 | 2830 | 2c35 | 3929 | 3d73 | 3866 |
| 3100760 | 6374 | 5f5f | 3131 | 696d | 616e | 6970 | 5f6c | 6f6e | 673a | 2830 | 2c34 | 3429 | 2c30 | 2c33 | 323b | 6172 | 675f | 5f31 | 3169 | 6d61 | 6e69 | 705f | 6c6f | 6e67 |
| 3101040 | 3a28 | 302c | 3129 | 2c33 | 322c | 3332 | 3b3b | 0069 | 6d61 | 6e69 | 705f | 6c6f | 6e67 | 3a5a | 6369 | 6d61 | 6e69 | 705f | 6c6f | 6e67 | 3b3b | 5f5f | 6374 | 5f5f |
| 3101120 | 3131 | 696d | 616e | 6970 | 5f6c | 6f6e | 6746 | 5046 | 5237 | 6973 | 7472 | 6561 | 6d6c | 5f52 | 3769 | 7374 | 7265 | 616d | 6c20 | 3b3b | 5f5f | 7273 | 5f5f | 4652 |
| 3101200 | 3769 | 7374 | 7265 | 616d | 5231 | 3169 | 6d61 | 6e69 | 705f | 6c6f | 6e67 | 203b | 0069 | 6170 | 706c | 795f | 6c6f | 6e67 | 3a54 | 2830 | 2c36 | 3029 | 3d73 | 3466 |
| 3101260 | 6374 | 5f5f | 3131 | 6961 | 7070 | 6c79 | 5f6c | 6f6e | 673a | 2830 | 2c34 | 3429 | 2c30 | 2c33 | 323b | 3b00 | 6961 | 7070 | 6c79 | 5f6c | 6f6e | 673a | 5a63 | 6961 |
| 3101340 | 7070 | 6c79 | 5f6c | 6f6e | 673b | 3b5f | 5f63 | 745f | 5f31 | 3169 | 6170 | 706c | 795f | 6c6f | 6e67 | 4650 | 4652 | 3769 | 7374 | 7265 | 616d | 6c5f | 5237 | 6973 |
| 3101420 | 7472 | 6561 | 6d20 | 5f5f | 636c | 5f5f | 3131 | 6961 | 7070 | 6c79 | 5f6c | 6f6e | 6746 | 6c20 | 3b3b | 3b00 | 6f6d | 616e | 6970 | 5f6c | 6f6e | 673a | 5428 | 302c |
| 3101500 | 3631 | 293d | 7338 | 6663 | 745f | 5f31 | 316f | 6d61 | 6e69 | 705f | 6c6f | 6e67 | 3a28 | 302c | 3439 | 292c | 302c | 3332 | 3b61 | 7267 | 5f5f | 3131 | 6f6d | 616e |
| 3101560 | 6970 | 5f6c | 6f6e | 673a | 2830 | 2c31 | 292c | 3332 | 2c33 | 323b | 3b00 | 6f6d | 616e | 6970 | 5f6c | 6f6e | 673a | 5a63 | 6f6d | 616e | 6970 | 5f6c | 6f6e | 673b |
| 3101640 | 3b5f | 5f63 | 745f | 5f31 | 316f | 6d61 | 6e69 | 705f | 6c6f | 6e67 | 4650 | 4652 | 376f | 7374 | 7265 | 616d | 6c5f | 5237 | 6f73 | 7472 | 6561 | 6d6c | 203b | 3b5f |
| 3101720 | 5f6c | 735f | 5f46 | 5237 | 6f73 | 7472 | 6561 | 6d52 | 3131 | 6f6d | 616e | 6970 | 5f6c | 6f6e | 6720 | 3b00 | 6f61 | 7070 | 6c79 | 5f6c | 6f6e | 673a | 5428 | 302c |
| 3102000 | 3632 | 293d | 7334 | 6663 | 745f | 5f31 | 316f | 6170 | 706c | 795f | 6c6f | 6e67 | 3a28 | 302c | 3439 | 292c | 302c | 3332 | 3b3b | 006f | 6170 | 706c | 795f | 6c6f |
| 3102060 | 6e67 | 3a5a | 636f | 6170 | 706c | 795f | 6c6f | 6e67 | 3b3b | 5f5f | 6374 | 5f5f | 3131 | 6f61 | 7070 | 6c79 | 5f6c | 6f6e | 6746 | 5046 | 5237 | 6f73 | 7472 | 6561 |
| 3102140 | 6d6c | 5f52 | 376f | 7374 | 7265 | 616d | 205f | 5f63 | 6c5f | 5f31 | 316f | 6170 | 706c | 795f | 6c6f | 6e67 | 466c | 203b | 3b3b | 0069 | 6f6d | 616e | 6970 | 5f6c |
| 3102220 | 6f6e | 673a | 5428 | 302c | 3633 | 293d | 7338 | 6663 | 745f | 5f31 | 3269 | 6f6d | 616e | 6970 | 5f6c | 6f6e | 673a | 2830 | 2c35 | 3329 | 2c30 | 2c33 | 323b | 6172 |
| 3102300 | 675f | 5f31 | 3269 | 6f6d | 616e | 6970 | 5f6c | 6f6e | 673a | 2830 | 2c31 | 292c | 3332 | 2c33 | 323b | 3b00 | 696f | 6d61 | 6e69 | 705f | 6c6f | 6e67 | 3a5a | 6369 |
| 3102360 | 6f6d | 616e | 6970 | 5f6c | 6f6e | 673b | 3b5f | 5f63 | 745f | 5f31 | 3269 | 6f6d | 616e | 6970 | 5f6c | 6f6e | 6746 | 5046 | 5238 | 696f | 7374 | 7265 | 616d | 6c5f |
| 3102440 | 5238 | 696f | 7374 | 7265 | 616d | 6c20 | 3b3b | 5f5f | 6c73 | 5f5f | 4652 | 3869 | 6f73 | 7472 | 6561 | 6d52 | 3132 | 696f | 6d61 | 6e69 | 705f | 6c6f | 6e67 | 205f |
| 3102520 | 5f72 | 735f | 5f46 | 5238 | 696f | 7374 | 7265 | 616d | 5231 | 3269 | 6f6d | 616e | 6970 | 5f6c | 6f6e | 6720 | 3b00 | 696f | 6170 | 706c | 795f | 6c6f | 6e67 | 3a54 |
| 3102600 | 2830 | 2c36 | 3429 | 3d73 | 3466 | 6374 | 5f5f | 3132 | 696f | 6170 | 706c | 795f | 6c6f | 6e67 | 3a28 | 302c | 3533 | 292c | 302c | 3332 | 3b3b | 0069 | 6f61 | 7070 |
| 3102660 | 6c79 | 5f6c | 6f6e | 673a | 5a63 | 696f | 6170 | 706c | 795f | 6c6f | 6e67 | 3b3b | 5f5f | 6374 | 5f5f | 3132 | 696f | 6170 | 706c | 795f | 6c6f | 6e67 | 4650 | 4652 |
| 3102740 | 3869 | 6f73 | 7472 | 6561 | 6d6c | 5f52 | 3869 | 6f73 | 7472 | 6561 | 6d20 | 5f5f | 636c | 5f5f | 3132 | 696f | 6170 | 706c | 795f | 6c6f | 6e67 | 466c | 203b | 3b3b |
| 3103020 | 0065 | 7272 | 6e6f | 3a47 | 2830 | 2c31 | 2900 | 7379 | 735f | 6e65 | 7272 | 3a47 | 2830 | 2c31 | 2900 | 7374 | 6469 | 6f62 | 7566 | 3a54 | 2830 | 2c36 | 3629 | 3d73 |
| 3103100 | 3532 | 616c | 6c6f | 635f | 5f39 | 7374 | 7265 | 616d | 6275 | 663a | 2830 | 2c34 | 292c | 302c | 3136 | 3b78 | 5f75 | 6e62 | 7566 | 5f5f | 3973 | 7472 | 6561 | 6d62 |
| 3103160 | 7566 | 3a28 | 302c | 3429 | 2c31 | 362c | 3136 | 3b78 | 5f62 | 6173 | 655f | 5f39 | 7374 | 7265 | 616d | 6275 | 663a | 2830 | 2c33 | 3129 | 2c33 | 322c | 3332 | 3b78 |
| 3103240 | 5f70 | 6261 | 7365 | 5f5f | 3973 | 7472 | 6561 | 6d62 | 7566 | 3a28 | 302c | 3331 | 292c | 3634 | 2c33 | 323b | 785f | 7070 | 7472 | 5f5f | 3973 | 7472 | 6561 | 6d62 |
| 3103320 | 7566 | 3a28 | 302c | 3331 | 292c | 3936 | 2c33 | 323b | 785f | 6570 | 7074 | 725f | 5f39 | 7374 | 7265 | 616d | 6275 | 663a | 2830 | 2c33 | 3129 | 2c31 | 3238 | 2c33 |

```
3103400 323b 785f 6770 7472 5f5f 3973 7472 6561 6d62 7566 3a28 302c 3331 292c 3136 302c 3332 3b78 5f65 6770 7472 5f5f 3973 7472
3103460 6561 6d62 7566 3a28 302c 3331 292c 3139 322c 3332 3b5c 0078 5f65 6261 636b 5f5f 3973 7472 6561 6d62 7566 3a28 302c 3331
3103540 292c 3232 342c 3332 3b78 5f62 6c65 6e5f 5f39 7374 7265 6161 6275 663a 2830 2c31 292c 3235 362c 3332 3b5f 5f76 7074 725f
3103620 5f39 7374 7265 616d 6275 663a 2830 2c33 3029 2c32 3838 2c33 323b 6670 5f5f 3873 7464 696f 6275 663a 2830 2c36 3729 3d2a
3103700 2830 2c36 3529 3178 735f 696f 6275 663a 2c33 3230 2c33 323b 6c61 7374 5f6f 705f 5f38 7374 6469 6f62 7566 3a28 302c 3129
3103760 2c33 3532 2c33 323b 6275 665f 5f38 7374 6469 6f62 7566 3a28 302c 3638 293d 6172 2830 2c31 293b 303b 313b 2830 2c32 292c
3104040 3338 342c 3136 3b3b 0073 7464 696f 6275 663a 5a63 7374 6469 6f62 7566 3b73 7472 6561 6d62 7566 3b6f 7665 7266 6c6f 775f
3104120 5f38 7374 6469 6f62 7566 4669 2075 6e64 6572 666c 6f77 5f5f 3873 7464 696f 6275 6646 7620 7379 6e63 5f5f 3873 7464 696f
3104200 6275 6646 7620 7365 656b 6f66 665f 5f38 7374 6469 6f62 7566 466c 3873 6565 6b5f 6469 7269 2070 6261 636b 6661 696c 5f5f
3104260 3873 7464 696f 6275 6646 6920 5f5f 6374 5f5f 3873 7464 696f 6275 6646 5036 5f69 6f62 7566 205f 5f63 745f 5f38 7374 6469
3104340 6f62 7566 4652 4338 7374 6469 6f62 7566 205c 0073 7464 696f 6669 6c65 5f5f 3873 7464 696f 6275 6646 7620 5f5f 6474 5f5f
3104420 3873 7464 696f 6275 6646 7620 3b3b 3b00 6669 6c65 6275 663a 5428 302c 3639 293d 7336 3461 6c6c 6f63 5f5f 3973 7472 6561
3104500 6d62 7566 3a28 302c 3429 2c30 2c31 363b 785f 756e 6275 665f 5f39 7374 7265 616d 6275 663a 2830 2c34 292c 3136 2c31 363b
3104560 785f 6261 7365 5f5f 3973 7472 6561 6d62 7566 3a28 302c 3331 292c 3332 2c33 323b 785f 7062 6173 655f 5f39 7374 7265 616d
3104640 6275 663a 2830 2c33 3129 2c36 342c 3332 3b78 5f70 7074 725f 5f39 7374 7265 616d 6275 663a 2830 2c33 3129 2c39 362c 3332
3104720 3b78 5f65 7070 7472 5f5f 3973 7472 6561 6d62 7566 3a28 302c 3331 292c 3132 382c 3332 3b78 5f67 7074 725f 5f39 7374 7265
3105000 616d 6275 663a 2830 2c33 3129 2c31 3630 2c33 323b 785f 6567 7074 725f 5f39 7374 7265 616d 6275 663a 2830 2c33 3129 2c31
3105060 3932 2c33 323b 5c00 785f 6562 6163 6b5f 5f39 7374 7265 6164 6275 663a 2830 2c33 3129 2c32 3234 2c33 323b 785f 626c 656e
3105140 5f5f 3973 7472 6561 6d62 7566 3a28 302c 3129 2c32 3536 2c33 323b 5f5f 7670 7472 5f5f 3973 7472 6561 6d62 7566 3a28 302c
3105220 3330 292c 3238 382c 3332 3b78 6664 5f5f 3766 696c 6562 7566 3a28 302c 3129 2c33 3230 2c33 323b 6d6f 6465 5f5f 3766 696c
3105300 6562 7566 3a28 302c 3129 2c33 3532 2c33 323b 6f70 656e 6564 5f5f 3766 696c 6562 7566 3a28 302c 3229 2c33 3834 2c38 3b6c
3105360 6173 745f 7365 656b 5f5f 3766 696c 6562 7566 3a28 302c 3129 2c34 3136 2c33 323b 696e 5f73 7461 7274 5f5f 3766 696c 6562
3105440 7566 3a28 302c 3331 292c 3434 382c 3332 3b6c 6168 6561 645f 5f37 6669 6c65 6275 663a 2830 2c36 3829 2c34 3830 2c31 363b
3105520 3b00 6f70 656e 7072 6f74 5f5f 3766 696c 6562 7566 3a47 2830 2c31 2900 6669 6c65 6275 663a 5a63 6669 6c65 6275 663b 7374
3105600 7265 616d 6275 663b 5f5f 6374 5f5f 3766 696c 6562 7566 4676 205f 5f63 745f 5f37 6669 6c65 6275 6646 6920 5f5f 6374 5f5f
3105660 3766 696c 6562 7566 4669 5063 5431 205f 5f63 745f 5f37 6669 6c65 6275 6646 5243 3766 696c 6562 7566 2069 735f 6f70 656e
3105740 5f5f 3766 696c 6562 7566 4676 2066 645f 5f37 6669 6c65 6275 6646 7620 6f70 656e 5f5f 3766 696c 6562 7566 4650 4363 6954
3106020 3220 6174 7461 6368 5f5f 3766 696c 6562 7566 4669 2063 6c6f 7365 5f5f 3766 696c 6562 7566 4676 205c 005f 5f64 745f 5f37
3106100 6669 6c65 6275 6646 7620 6f76 6572 666c 6f77 5f5f 3766 696c 6562 7566 4669 2075 6e64 6572 666c 6f77 5f5f 3766 696c 6562
3106160 7566 4676 2073 796e 635f 5f37 6669 6c65 6275 6646 7620 7365 656b 6f66 665f 5f37 6669 6c65 6275 6646 6c38 7365 656b 5f64
3106240 6972 6920 7365 7462 7566 5f5f 3766 696c 6562 7566 4650 6369 206c 6173 745f 6f70 5f5f 3766 696c 6562 7566 4676 203b 6f70
3106320 656e 7072 6f74 5f5f 3766 696c 6562 7566 203b 3b00 6673 7472 6561 6d62 6173 653a 5428 302c 3730 293d 7331 3332 6275 665f
3106400 5f31 3166 7374 7265 616d 6261 7365 3a28 302c 3639 292c 302c 3531 323b 5f5f 7670 7472 5f5f 3131 6673 7472 6561 6d62 6173
3106460 653a 2830 2c33 3029 2c35 3132 2c33 323b 5069 6f73 3a28 302c 3333 292c 3534 342c 3332 3b4f 696f 733a 2830 2c32 3329 2c35
3106540 3736 2c34 3830 3b3b 0066 7374 7265 616d 6261 7365 3a5a 6366 7374 7265 616d 6261 7365 3b69 6f73 3b5f 5f63 745f 5f31 3166
3106620 7374 7265 616d 6261 7365 4676 205f 5f63 745f 5f31 3166 7374 7265 616d 6261 7365 4650 4363 6954 3220 5f5f 6374 5f5f 3131
3106700 6673 7472 6561 6162 6173 6546 6920 5f5f 6374 5f5f 3131 6673 7472 6561 6d62 6173 6546 6950 6354 3120 5f5f 6374 5f5f 3131
3106760 6673 7472 6561 6162 6173 6546 5231 3166 7374 7265 616d 6261 7365 205f 5f64 745f 5f31 3166 7374 7265 616d 6261 7365 4676
3107040 206f 7065 6e5f 5f31 3166 7374 7265 616d 6261 7365 4650 4363 6954 3220 5c00 6174 7461 6368 5f5f 3131 6673 7472 6561 6d62
3107120 6173 6546 6920 636c 6f73 655f 5f31 3166 7374 7265 616d 6261 7365 4676 2073 6574 6275 665f 5f31 3166 7374 7265 616d 6261
3107200 7365 4650 6369 2072 6462 7566 5f5f 3131 6673 7472 6561 6462 6173 6546 7620 7665 7269 6679 5f5f 3131 6673 7472 6561 6d62
3107260 6173 6546 6920 3b3b 3b00 7374 6174 655f 7661 6c75 653a 7428 302c 3138 2900 4f62 6a65 6374 3a54 2830 2c37 3129 3d73 345f
3107340 5f76 7074 725f 5f36 4f62 6a65 6374 3a28 302c 3330 292c 302c 3332 3b3b 004f 626a 6563 743a 5a63 4f62 6a65 6374 3b3b 5f5f
3107420 6374 5f5f 364f 626a 6563 7446 7620 5f5f 6374 5f5f 364f 626a 6563 7446 5243 364f 626a 6563 7420 6572 726f 724d 656d 6f72
3107500 795f 5f36 4f62 6a65 6374 4650 6354 3120 6578 706c 6169 6e5f 5f36 4f62 6a65 6374 4650 6320 696e 4f72 6465 725f 5f36 4f62
3107560 6a65 6374 4650 364f 626a 6563 7420 3b3b 3b00 5f5f 7074 626c 5f5f 364f 626a 6563 745f 5f4e 4f62 6a65 6374 5f64 625f 6378
3107640 783a 4728 302c 3330 2900 5046 3a74 2830 2c31 3529 0050 4643 3a74 2830 2c31 3529 0050 4649 3a74 2830 2c31 3529 004e 4f62
3107720 6a65 6374 3a54 2830 2c37 3229 3d73 385f 5f76 7074 725f 5f36 4f62 6a65 6374 3a28 302c 3330 292c 302c 3332 3b6e 616d 655f
3110000 5f37 4e4f 626a 6563 743a 2830 2c33 3129 2c33 322c 3332 3b3b 004e 4f62 6a65 6374 3a5a 634e 4f62 6a65 6374 3b4f 626a 6563
3110060 743b 5f5f 6374 5f5f 374e 4f62 6a65 6374 4650 6320 5f5f 6374 5f5f 374e 4f62 6a65 6374 4652 4337 4e4f 626a 6563 7420 7365
3110140 744e 616d 655f 5f37 4e4f 626a 6563 7446 5063 2067 6574 4e61 6d65 5f5f 374e 4f62 6a65 6374 4676 2065 7870 6c61 696e 5f5f
3110220 374e 4f62 6a65 6374 4650 6320 6765 7441 7474 725f 5f37 4e4f 626a 6563 7446 6920 6765 7450 726f 705f 5f37 4e4f 626a 6563
3110300 7446 5063 6920 7365 7450 726f 705f 5f37 4e4f 626a 6563 7446 5063 5431 205c 0073 6574 5072 6f70 5f5f 374e 4f62 6a65 6374
3110360 4650 6369 2073 6574 5072 6f70 5f5f 374e 4f62 6a65 6374 4650 6366 2069 7347 5445 5f5f 374e 4f62 6a65 6374 4650 364f 626a
3110440 6563 7420 6973 4c54 455f 5f37 4e4f 626a 6563 7446 5036 4f62 6a65 6374 203b 3b3b 006f 7374 7265 616d 5f77 6974 6861 7373
```

```
3110520  6967 6e3a 5428 302c 3337 293d 7336 385f 5f76 7074 725f 5f37 6f73 7472 6561 6d3a 2830 2c33 3029 2c30 2c33 323b 5069 6f73
3110600  3a28 302c 3333 292c 3332 2c33 323b 4f69 6f73 3a28 302c 3233 292c 3634 2c34 3830 3b3b 006f 7374 7265 616d 5f77 6974 6861
3110660  7373 6967 6e3a 5a63 6f73 7472 6561 6d5f 7769 7468 6173 7369 676e 3b6f 7374 7265 616d 2069 6f73 3b5f 5f63 745f 5f31 386f
3110740  7374 7265 616d 5f77 6974 6861 7373 6967 6e46 7620 5f5f 6374 5f5f 3138 6f73 7472 6561 6d5f 7769 7468 6173 7369 676e 4652
3111020  3138 6f73 7472 6561 6d5f 7769 7468 6173 7369 676e 205f 5f64 745f 5f31 386f 7374 7265 616d 5f77 6974 6861 7373 6967 6e46
3111100  7620 5f5f 6173 5f5f 3138 6f73 7472 6561 6d5f 7769 7468 6173 7369 676e 4652 376f 7374 7265 616d 235c 005f 5f61 735f 5f31
3111160  386f 7374 7265 616d 5f77 6974 6861 7373 6967 6e46 5039 7374 7265 616d 6275 6620 3b3b 3b00 5046 423a 7428 302c 3135 2900
3111240  5f5f 7074 626c 5f5f 374e 4f62 6a65 6374 5f5f 4e4f 626a 6563 745f 6462 5f63 7878 3a47 2830 2c33 3029 005f 5f63 745f 5f37
3111320  4e4f 626a 6563 7446 5063 3a46 2830 2c37 3329 312a 2830 2c37 3229 005f 5f30 7468 6973 3a70 2830 2c37 3329 005f 5f30 6e3a
3111400  7028 302c 3331 2900 4e4f 626a 6563 745f 6462 2e63 7878 005f 5f30 7468 6973 3a72 2830 2c37 3329 005f 5f30 7468 6973 203a
3111460  5a74 6c00 5f5f 306e 203a 5a74 6c00 5f5f 6374 5f5f 374e 4f62 6a65 6374 4650 6320 3a5a 7446 0073 6574 4e61 6d65 5f5f 374e
3111540  4f62 6a65 6374 4650 633a 4628 302c 3229 005f 5f30 7468 6973 3a70 2830 2c37 3329 005f 5f30 6e3a 7028 302c 3331 2900 5f5f
3111620  3074 6869 733a 7228 302c 3733 2900 5f5f 3074 6869 7320 3a5a 746c 005f 5f30 6e20 3a5a 746c 0073 6574 4e61 6d65 5f5f 374e
3111700  4f62 6a65 6374 4650 6320 3a5a 7446 005f 5f73 7469 5f5f 4e4f 626a 6563 745f 6462 5f63 7878 5f5f 5f63 745f 3a46 2830 2c32
3111760  2900 2f75 7372 2f43 432f 7375 6e34 2f69 6e63 6c2f 696f 7374 7265 616d 2e68 005f 5f73 7464 5f5f 4e4f 626a 6563 745f 6462
3112040  5f63 7878 5f5f 5f63 745f 3a46 2830 2c32 2900 5f5f 7674 626c 5f5f 374e 4f62 6a65 6374 5f5f 4e4f 626a 6563 745f 6462 5f63
3112120  7878 3a47 2830 2c37 3429 3d61 7228 302c 3129 3b30 3b31 303b 2830 2c31 3529 0069 734c 5445 5f5f 374e 4f62 6a65 6374 4650
3112200  364f 626a 6563 743a 6628 302c 3129 005f 5f30 7468 6973 3a70 2830 2c37 3329 005f 5f30 5f5f 4133 393a 7028 302c 3735 293d
3112260  2a28 302c 3731 2900 2e2f 6878 782f 4e4f 626a 6563 745f 6462 2e68 7878 005f 5f30 7468 6973 203a 5a74 6c00 5f5f 305f 5f41
3112340  3339 203a 5a74 6c00 6973 4c54 455f 5f37 4e4f 626a 6563 7446 5036 4f62 6a65 6374 203a 5a74 4600 6973 4754 455f 5f37 4e4f
3112420  626a 6563 7446 5036 4f62 6a65 6374 3a66 2830 2c31 2900 5f5f 3074 6869 733a 7028 302c 3733 2900 5f5f 305f 5f41 3338 3a70
3112500  2830 2c37 3529 005f 5f30 7468 6973 203a 5a74 6c00 5f5f 305f 5f41 3338 203a 5a74 6c00 6973 4754 455f 5f37 4e4f 626a 6563
3112560  7446 5036 4f62 6a65 6374 203a 5a74 4600 7365 7450 726f 705f 5f37 4e4f 626a 6563 7446 5063 663a 6628 302c 3229 005f 5f30
3112640  7468 6973 3a70 2830 2c37 3329 005f 5f31 5f5f 4133 363a 7028 302c 3331 2900 5f5f 315f 5f41 3337 3a70 2830 2c31 3029 005f
3112720  5f30 7468 6973 203a 5a74 6c00 5f5f 315f 5f41 3336 203a 5a74 6c00 5f5f 315f 5f41 3337 203a 5a74 6c00 7365 7450 726f 705f
3113000  5f37 4e4f 626a 6563 7446 5063 6620 3a5a 7446 0073 6574 5072 6f70 5f5f 374e 4f62 6a65 6374 4650 6369 3a66 2830 2c32 2900
3113060  5f5f 3074 6869 733a 7028 302c 3733 2900 5f5f 315f 5f41 3334 3a70 2830 2c33 3129 005f 5f31 5f5f 4133 353a 7028 302c 3129
3113140  005f 5f30 7468 6973 203a 5a74 6c00 5f5f 315f 5f41 3334 203a 5a74 6c00 5f5f 315f 5f41 3335 203a 5a74 6c00 7365 7450 726f
3113220  705f 5f37 4e4f 626a 6563 7446 5063 6920 3a5a 7446 0073 6574 5072 6f70 5f5f 374e 4f62 6a65 6374 4650 6354 313a 6628 302c
3113300  3229 005f 5f30 7468 6973 3a70 2830 2c37 3329 005f 5f31 5f5f 4133 323a 7028 302c 3331 2900 5f5f 315f 5f41 3333 3a70 2830
3113360  2c33 3129 005f 5f30 7468 6973 203a 5a74 6c00 5f5f 315f 5f41 3332 203a 5a74 6c00 5f5f 315f 5f41 3333 203a 5a74 6c00 7365
3113440  7450 726f 705f 5f37 4e4f 626a 6563 7446 5063 5431 203a 5a74 4600 6765 7450 726f 705f 5f37 4e4f 626a 6563 7446 5063 693a
3113520  6628 302c 3331 2900 5f5f 3074 6869 733a 7028 302c 3733 2900 5f5f 305f 5f41 3330 3a70 2830 2c33 3129 005f 5f30 5f5f 4133
3113600  313a 7028 302c 3129 005f 5f30 7468 6973 203a 5a74 6c00 5f5f 305f 5f41 3330 203a 5a74 6c00 5f5f 305f 5f41 3331 203a 5a74
3113660  6c00 6765 7450 726f 705f 5f37 4e4f 626a 6563 7446 5063 6920 3a5a 7446 0067 6574 4174 7472 5f5f 374e 4f62 6a65 6374 4669
3113740  3a66 2830 2c33 3129 005f 5f30 7468 6973 3a70 2830 2c37 3329 005f 5f30 5f5f 4132 393a 7028 302c 3129 005f 5f30 7468 6973
3114020  203a 5a74 6c00 5f5f 305f 5f41 3239 203a 5a74 6c00 6765 7441 7474 725f 5f37 4e4f 626a 6563 7446 6920 3a5a 7446 0065 7870
3114100  6c61 696e 5f5f 374e 4f62 6a65 6374 4650 633a 6628 302c 3229 005f 5f30 7468 6973 3a70 2830 2c37 3329 005f 5f30 733a 7028
3114160  302c 3331 2900 5f5f 3074 6869 733a 7228 302c 3733 2900 5f5f 3074 6869 7320 3a5a 746c 005f 5f30 7320 3a5a 746c 0065 7870
3114240  6c61 696e 5f5f 374e 4f62 6a65 6374 4650 6320 3a5a 7446 0069 6e4f 7264 6572 5f5f 364f 626a 6563 7446 5036 4f62 6a65 6374
3114320  3a66 2830 2c31 2900 5f5f 3074 6869 733a 7028 302c 3735 2900 5f5f 305f 5f41 3237 3a70 2830 2c37 3529 002e 2f68 7878 2f4f
3114400  626a 6563 745f 6462 2e68 7878 005f 5f30 7468 6973 203a 5a74 6c00 5f5f 305f 5f41 3237 203a 5a74 6c00 696e 4f72 6465 725f
3114460  5f36 4f62 6a65 6374 4650 364f 626a 6563 7420 3a5a 7446 004f 626a 6563 745f 6462 2e6f 005f 7075 745f 5f37 6f73 7472 6561
3114540  6146 6300 5f69 6f73 7472 6561 6d5f 696e 6974 005f 696e 4f72 6465 725f 5f36 4f62 6a65 6374 4650 364f 626a 6563 7400 2f68
3114620  6f6d 652f 6f73 6173 312f 612f 6162 2f73 7263 2f6e 6577 6f62 6a65 6374 732f 6162 732f 432b 2b2e 3734 3534 2f00 4f62 6a65
3114700  6374 5f64 622e 6300 4f62 6a65 6374 5f64 622e 6378 7800 696e 743a 7428 302c 3129 3d72 2830 2c31 293b 2d32 3134 3734 3833
3114760  3634 383b 3231 3437 3438 3336 3437 3b00 6368 6172 3a74 2830 2c32 2933 7228 302c 3229 3b30 3b31 3237 3b00 6c6f 6e67 3a74
3115040  2830 2c33 293d 7228 302c 3129 3b2d 3231 3437 3438 3336 3438 3b32 3134 3734 3833 3634 373b 0073 686f 7274 3a74 2830 2c34
3115120  293d 7228 302c 3129 3b2d 3332 3736 383b 3332 3736 373b 0075 6e73 6967 6e65 6420 6368 6172 3a74 2830 2c35 293d 7228 302c
3115200  3129 3b30 3b32 3535 3b00 756e 7369 676e 6564 2073 686f 7274 3a74 2830 2c36 293d 7228 302c 3129 3b30 3b36 3535 3335 3b00
3115260  756e 7369 676e 6564 206c 6f6e 673a 7428 302c 3729 3d72 2830 2c31 293b 303b 2d31 3b00 756e 7369 676e 6564 2069 6e74 3a74
3115340  2830 2c38 293d 7228 302c 3129 3b30 3b2d 313b 0066 6c6f 6174 3a74 2830 2c39 293d 7228 302c 3129 3b34 3b30 3b00 646f 7562
3115420  6c65 3a74 2830 2c31 3029 3d72 2830 2c31 293b 383b 303b 0076 6f69 643a 7428 302c 3131 293d 2830 2c31 3129 003f 3f3f 3a74
3115500  2830 2c31 3229 3d28 302c 3129 005f 5f76 7074 703a 7428 302c 3133 293d 2a28 302c 3134 293d 6628 302c 3129 005f 5f6d 7074
3115560  723a 5428 302c 3135 293d 7338 643a 2830 2c34 292c 302c 3136 3b69 3a28 302c 3429 2c31 362c 3136 3b66 3a28 302c 3133 292c
```

```
3115640 3332 2c33 323b 3b00 5f50 4656 5f3a 7428 302c 3136 293d 2a28 302c 3137 293d 6628 302c 3229 005f 5046 495f 3a74 2830 2c31
3115720 3329 0073 7472 6561 6d70 6f73 3a74 2830 2c31 2900 7374 7265 616d 6f66 663a 7428 302c 3129 0069 6f5f 7374 6174 653a 5428
3116000 302c 3138 293d 6567 6f6f 6462 6974 5f5f 696f 5f73 7461 7465 3a30 2c65 6f66 6269 745f 5f69 6f5f 7374 6174 653a 312c 6661
3116060 696c 6269 745f 5f69 6f5f 7374 6174 653a 322c 6261 6462 6974 5f5f 696f 5f73 7461 7465 3a33 2c68 6172 6466 6169 6c5f 5f69
3116140 6f5f 7374 6174 653a 342c 3b00 6f70 656e 5f6d 6f64 653a 5429 302c 3139 293d 6569 6e5f 5f6f 7065 6e5f 6d6f 6465 3a30 2c6f
3116220 7574 5f5f 6f70 656e 5f6d 6f64 653a 312c 6174 655f 5f6f 7065 6e5f 6d6f 6465 3a32 2c61 7070 5f5f 6f70 656e 5f6d 6f64 653a
3116300 332c 7472 756e 635f 5f6f 7065 6e5f 6d6f 6465 3a34 2c6e 6f63 7265 6174 655f 5f6f 7065 6e5f 6d6f 6465 3a35 2c6e 6f72 6570
3116360 6c61 6365 5f5f 6f70 656e 5f6d 6f64 653a 362c 3b00 7365 656b 5f64 6972 3a54 2830 2c32 3029 3d65 6265 675f 5f73 6565 6b5f
3116440 6469 723a 302c 6375 725f 5f73 6565 6b5f 6469 723a 312c 656e 645f 5f73 6565 6b5f 6469 723a 322c 3b00 5f5f 4531 3a54 2830
3116520 2c32 3129 3d65 736b 6970 7773 5f5f 5f5f 4531 3a30 2c6c 6566 745f 5f5f 5f45 313a 312c 7269 6768 745f 5f5f 5f45 313a 322c
3116600 696e 7465 726e 616c 5f5f 5f5f 4531 3a33 2c64 6563 5f5f 5f5f 4531 3a34 2c6f 6374 5f5f 5f5f 4531 3a35 2c68 6578 5f5f 5f5f
3116660 4531 3a36 2c73 696f 7762 6173 655f 5f5f 5f45 313a 372c 5c00 7368 6f77 706f 696e 745f 5f5f 5f45 313a 382c 7570 7065 7263
3116740 6173 655f 5f5f 5f45 313a 392c 7368 6f77 706f 735f 5f5f 5f45 313a 3130 2c73 6369 656e 7469 6669 635f 5f5f 5f45 313a 3131
3117020 2c66 6978 6564 5f5f 5f5f 4531 3a31 322c 756e 6974 6275 665f 5f5f 5f45 313a 3133 2c73 7464 696f 5f5f 5f5f 4531 3a31 342c
3117100 3b00 5f5f 4532 3a54 2830 2c32 3229 3d65 736b 6970 7069 6e67 5f5f 5f5f 4532 3a30 2c74 6965 645f 5f5f 5f45 323a 312c 3b00
3117160 696f 733a 5428 302c 3233 293d 7336 306e 7573 6572 5f5f 3369 6f73 3a28 302c 3129 2c30 2c33 323b 785f 7573 6572 5f5f 3369
3117240 6f73 3a28 302c 3237 293d 2a28 302c 3234 293d 7875 696f 735f 7573 6572 5f75 6e69 6f6e 3a2c 3332 2c33 323b 6270 5f5f 3369
3117320 6f73 3a28 302c 3238 293d 2a28 302c 3235 293d 7373 7374 7265 616d 6275 663a 2c36 342c 3332 3b73 7461 7465 5f5f 3369 6f73
3117400 3a28 302c 3129 2c39 362c 3332 3b69 737c 6563 6961 6c5f 5f33 696f 733a 2830 2c31 292c 3132 382c 3332 3b6f 7370 6563 6961
3117460 6c5f 5f33 696f 733a 2830 2c31 292c 3136 302c 3332 3b69 7366 785f 7370 6563 6961 6c5f 5f33 696f 733a 2830 2c31 292c 3139
3117540 322c 3332 3b6f 7366 785f 7370 6563 6961 6c5f 5f33 696f 733a 2830 2c31 292c 3232 342c 3332 3b5c 0064 656c 6275 665f 5f33
3117620 696f 733a 2830 2c31 292c 3235 362c 3332 3b78 5f74 6965 5f5f 3369 6f73 3a28 302c 3239 293d 2a28 302c 3236 293d 7873 6f73
3117700 7472 6561 6d3a 2c32 3838 2c33 323b 785f 666c 6167 735f 5f33 696f 733a 2830 2c31 292c 3332 302c 3332 3b78 5f70 7265 6369
3117760 7369 6f6e 5f5f 3369 6f73 3a28 302c 3429 2c33 3532 2c31 363b 785f 6669 6c6c 5f5f 3369 6f73 3a28 302c 3229 2c33 3638 2c38
3120040 3b78 5f77 6964 7468 5f5f 3369 6f73 3a28 302c 3429 2c33 3834 2c31 363b 6173 7369 676e 5f70 7269 7661 7465 5f5f 3369 6f73
3120120 3a28 302c 3129 2c34 3136 2c33 323b 5f5f 7670 7472 5f5f 3369 6f73 3a28 302c 3330 293d 2a28 302c 3135 292c 3434 382c 3332
3120200 3b3b 0062 6173 6566 6965 6c64 5f5f 3369 6f73 3a47 2830 2c31 2900 6164 6a75 7374 6669 656c 645f 5f33 696f 733a 4728 302c
3120260 3129 0066 6c6f 6174 6669 656c 645f 5f33 696f 733a 4728 302c 3129 006e 6578 7462 6974 5f5f 3369 6f73 3a47 2830 2c31 2900
3120340 6e65 7874 776f 7264 5f5f 3369 6f73 3a47 2830 2c31 2900 7374 6469 6f66 6c75 7368 5f5f 3369 6f73 3a47 2830 2c31 3629 0069
3120420 6f73 3a5a 6369 6f73 3b3b 5f5f 6374 5f5f 3369 6f73 4650 3973 7472 6561 6d62 7566 205f 5f63 745f 5f33 696f 7346 7620 5f5f
3120500 6374 5f5f 3369 6f73 4652 3369 6f73 205f 5f64 745f 5f33 696f 7346 7620 666c 6167 735f 5f33 696f 7346 7620 666c 6167 735f
3120560 5f33 696f 7346 6c20 7365 7466 5f5f 3369 6f73 466c 5431 2073 6574 665f 5f33 696f 7346 6c20 756e 7365 7466 5f5f 3369 6f73
3120640 466c 2077 6964 7468 5f5f 3369 6f73 4676 2077 6964 7468 5f5f 3369 6f73 4669 2074 6965 5f5f 3369 6f73 4650 376f 7374 7265
3120720 616d 205c 0074 6965 5f5f 3369 6f73 4676 2066 696c 6c5f 5f33 696f 7346 6320 6669 6c6c 5f5f 3369 6f73 4676 2070 7265 6369
3121000 7369 6f6e 5f5f 3369 6f73 4669 2070 7265 6369 7369 6f6e 5f5f 3369 6f73 4676 2072 6473 7461 7465 5f5f 3369 6f73 4676 205f
3121060 5f6f 7050 765f 5f33 696f 7346 7620 5f5f 5e74 5f5f 3369 6f73 4676 2065 6f66 5f5f 3369 6f73 4676 2066 6169 6c5f 5f33 696f
3121140 7346 7620 6261 645f 5f33 696f 7346 7620 676f 6f64 5f5f 3369 6f73 4676 2063 6c65 6172 5f5f 3369 6f73 4669 2072 6462 7566
3121220 5f5f 3369 6f73 4676 205c 0069 776f 7264 5f5f 3369 6f73 4669 2070 776f 7264 5f5f 3369 6f73 4669 2062 6974 616c 6c6f 635f
3121300 5f33 696f 7353 4576 2078 616c 6c6f 635f 5f33 696f 7353 4676 2075 7265 7369 7a65 5f5f 3369 6f73 4669 2073 796e 635f 7769
3121360 7468 5f73 7464 696f 5f5f 3369 6f73 5346 7620 7365 7473 7461 7465 5f5f 3369 6f73 4669 2069 6e69 745f 5f33 696f 7346 5039
3121440 7374 7265 616d 6275 6620 5f5f 6173 5f5f 3369 6f73 4652 3369 6f73 2073 6b69 705f 5f33 696f 7346 6920 3b62 6173 6566 6965
3121520 6c64 5f5f 3369 6f73 205c 0061 646a 7573 7456 6965 6c64 5f5f 3369 6f73 2066 6c6f 6174 6669 656c 645f 5f33 696f 7320 6e65
3121600 7874 6269 745f 5f33 696f 7320 6e65 7874 776f 7264 5f5f 3369 6f73 2073 7464 696f 666c 7573 685f 5f33 696f 7320 3b3b 0073
3121660 7472 6561 6d62 7566 3a54 2830 2c32 3529 3d73 3430 616c 6c6f 635f 5f39 7374 7265 616d 6275 663a 2830 2c34 292c 302c 3136
3121740 3b78 5f75 6e62 7566 5f5f 3973 7472 6561 6d62 7566 3a28 302c 3429 2c31 362c 3136 3b78 5f62 6173 655f 5f39 7374 7265 616d
3122020 6275 663a 2830 2c33 3129 3d2a 2830 2c32 292c 3332 2c33 323b 785f 7062 6173 655f 5f39 7374 7265 616d 6275 663a 2830 2c33
3122100 3129 2c36 342c 3332 3b78 5f70 7274 725f 5f39 7374 7265 616d 6275 663a 2830 2c33 3129 2c39 362c 3332 3b78 5f65 7070 7472
3122160 5f5f 3973 7472 6561 6d62 7566 3a28 302c 3331 292c 3132 382c 3332 3b78 5f67 7074 725f 5f39 7374 7265 616d 6275 663a 2830
3122240 2c33 3129 2c31 3630 2c33 323b 785f 6567 7074 725f 5f39 7374 7265 616d 6275 663a 2830 2c33 3129 2c31 3932 2c33 323b 5c00
3122320 785f 6562 6163 6b5f 5f39 7374 7265 616d 6275 663a 2830 2c33 3129 2c32 3234 2c33 323b 785f 626c 656e 5f5f 3973 7472 6561
3122400 6d62 7566 3a28 302c 3129 2c32 3536 2c33 323b 5f5f 7670 7472 5f5f 3973 7472 6561 6d62 7566 3a28 302c 3330 292c 3238 382c
3122460 3332 3b3b 0073 7472 6561 6d62 7566 3a5a 6373 7472 6561 6d62 7566 3b3b 5f5f 6374 5f5f 3973 7472 6561 6d62 7566 4652 3973
3122540 7472 6561 6d62 7566 205f 5f63 745f 5f39 7374 7265 616d 6275 6646 7620 5f5f 6374 5f5f 3973 7472 6561 6d62 7566 4650 6369
3122620 205f 5f63 745f 5f39 7374 7265 616d 6275 6646 5063 6954 3220 5f5f 6173 5f5f 3973 7472 6561 6d62 7566 4652 3973 7472 6561
3122700 6d62 7566 2064 6270 5f5f 3973 7472 6561 6d62 7566 4676 2062 6173 655f 5f39 7374 7265 616d 6275 6646 7620 7062 6173 655f
```

```
3122760 5f39 7374 7265 616d 6275 6646 7620 5c00 7070 7472 5f5f 3973 7472 6561 6d62 7566 4676 2065 7070 7472 5f5f 3973 7472 6561
3123040 6d62 7566 4676 2067 7074 725f 5f39 7374 7265 616d 6275 6646 7620 6567 7074 725f 5f39 7374 7265 616d 6275 6646 7620 6562
3123120 6163 6b5f 5f39 7374 7265 616d 6275 6646 7620 6562 7566 5f5f 3973 7472 6561 6d62 7566 4676 2062 6c65 6e5f 5f39 7374 7265
3123200 616d 6275 6646 7620 7365 7470 5f5f 3973 7472 6561 6d62 7566 4650 6354 3120 7365 7467 5f5f 3973 7472 6561 6d62 7566 4650
3123260 634e 3231 2070 6275 6d70 5f5f 3973 7472 6561 6d62 7566 4669 205c 0067 6275 6d70 5f5f 3973 7472 6561 6d62 7566 4669 2073
3123340 6574 625f 5f39 7374 7265 616d 6275 6646 5063 5431 6920 756e 6275 6666 6572 6564 5f5f 3973 7472 6561 6d62 7566 4676 2075
3123420 6e62 7566 6665 7265 645f 5f39 7374 7265 616d 6275 6646 6920 616c 6c6f 6361 7465 5f5f 3973 7472 6561 6d62 7566 4676 2064
3123500 6f61 6c6c 6f63 6174 655f 5f39 7374 7265 616d 6275 6646 7620 6f76 6572 666c 6f77 5f5f 3973 7472 6561 6d62 7566 4669 2075
3123560 6e64 6572 666c 6f77 5f5f 3973 7472 6561 6d62 7566 4676 205c 0070 6261 636b 6661 696c 5f5f 3973 7472 6561 6d62 7566 4669
3123640 2073 796e 635f 5f39 7374 7265 616d 6275 6646 7620 7365 656b 6f66 665f 5f39 7374 7265 616d 6275 6646 6c38 7365 656b 5f64
3123720 6972 6920 7365 656b 706f 735f 5f39 7374 7265 616d 6275 6646 6c69 2078 7370 7574 6e5f 5f39 7374 7265 616d 6275 6646 5043
3124000 6369 2078 7367 6574 6e5f 5f39 7374 7265 616d 6275 6646 5063 6920 696e 5f61 7661 696c 5f5f 3973 7472 6561 6d62 7566 4676
3124060 206f 7574 5f77 6169 7469 6e67 5f5f 3973 7472 6561 6d62 7566 4676 205c 0073 6765 7463 5f5f 3973 7472 6561 6d62 7566 4676
3124140 2073 6e65 7874 635f 5f39 7374 7265 616d 6275 6646 7620 7362 756d 7063 5f5f 3973 7472 6561 6d62 7566 4676 2073 746f 7373
3124220 635f 5f39 7374 7265 616d 6275 6646 7620 7370 7574 6261 636b 635f 5f39 7374 7265 616d 6275 6646 6320 7370 7574 635f 5f39
3124300 7374 7265 616d 6275 6646 6920 7370 7574 6e5f 5f39 7374 7265 616d 6275 6646 5043 6369 2073 6765 746e 5f5f 3973 7472 6561
3124360 6d62 7566 4650 6369 2073 6574 6275 665f 5f39 7374 7265 616d 6275 6646 5063 6920 5c00 7365 7462 7566 5f5f 3973 7472 6561
3124440 6d62 7566 4650 5563 6920 7365 7462 7566 5f5f 3973 7472 6561 6d62 7566 4650 6369 5432 205f 5f64 745f 5f39 7374 7265 616d
3124520 6275 6646 7620 785f 736e 6578 7463 5f5f 3973 7472 6561 6d62 7566 4676 203b 3b3b 0069 7374 7265 616d 3a54 2830 2c33 3229
3124600 3d73 3732 785f 6763 6f75 6e74 5f5f 3769 7374 7265 616d 3a28 302c 3129 2c30 2c33 323b 5f5f 7670 7472 5f5f 3769 7374 7265
3124660 616d 3a28 302c 3330 292c 3332 2c33 323b 5069 6f73 3a28 302c 3333 293d 2a28 302c 3233 292c 3634 2c33 323b 4f69 6f73 3a28
3124740 302c 3233 292c 3336 2c34 3830 3b3b 0069 7374 7265 616d 3a5a 6369 7374 7265 616d 3b69 6f73 3b5f 5f63 745f 5f37 6973 7472
3125020 6561 6d46 5039 7374 7265 616d 6275 6620 5f5f 6374 5f5f 3769 7374 7265 616d 4676 205f 5f63 745f 5f37 6973 7472 6561 6d46
3125100 5039 7374 7265 616d 6275 6669 5037 6f73 7472 6561 6d20 5f5f 6374 5f5f 3769 7374 7265 616d 4669 5063 5431 205f 5f63 745f
3125160 5f37 6973 7472 6561 6d46 6954 3150 376f 7374 7265 616d 205f 5f63 745f 5f37 6973 7472 6561 6d46 5237 6973 7472 6561 6d20
3125240 5f5f 6474 5f5f 3769 7374 7265 616d 4676 205c 0069 7066 785f 5f37 6973 7472 6561 6d46 6920 6973 6678 5f5f 3769 7374 7265
3125320 616d 4676 2073 6565 6b67 5f5f 3769 7374 7265 616d 466c 2073 6565 6b67 5f5f 3769 7374 7265 616d 466c 3873 6565 6b5f 6469
3125400 7220 7465 6c6c 675f 5f37 6973 7472 6561 6d46 7620 5f5f 7273 5f5f 3769 7374 7265 616d 4650 4652 3769 7374 7265 616d 5f52
3125460 3769 7374 7265 616d 205f 5f72 735f 5f37 6973 7472 6561 6d46 5046 5233 696f 735f 5233 696f 7320 5f5f 7273 5f5f 3769 7374
3125540 7265 616d 4650 6320 5f5f 7273 5f5f 3769 7374 7265 616d 4650 5563 205c 005f 5f72 735f 5f37 6973 7472 6561 6d46 5255 6320
3125620 5f5f 7273 5f5f 3769 7374 7265 616d 4652 6320 5f5f 7273 5f5f 3769 7374 7265 616d 4652 7320 5f5f 7273 5f5f 3769 7374 7265
3125700 616d 4652 6920 5f5f 7273 5f5f 3769 7374 7265 616d 4652 6c20 5f5f 7273 5f5f 3769 7374 7265 616d 4652 5573 205f 5f72 735f
3125760 5f37 6973 7472 6561 6d46 5255 6920 5f5f 7273 5f5f 3769 7374 7265 616d 4652 556c 205f 5f72 735f 5f37 6973 7472 6561 6d46
3126040 5266 205f 5f72 735f 5f37 6973 7472 6561 6d46 5264 205f 5f72 735f 5f37 6973 7472 6561 6d46 5039 7374 7265 616d 6275 6620
3126120 5c00 6765 745f 5f37 6973 7472 6561 6d46 5063 6963 2067 6574 5f5f 3769 7374 7265 616d 4650 5563 6963 2067 6574 5f5f 3769
3126200 7374 7265 616d 4652 3973 7472 6561 6d62 7566 6320 6765 745f 5f37 6973 7472 6561 6d46 5255 6320 6765 745f 5f37 6973 7472
3126260 6561 6d46 5263 2067 6574 5f5f 3769 7374 7265 616d 4676 2067 6574 6c69 6e65 5f5f 3769 7374 7265 616d 4650 6369 6320 6765
3126340 746c 696e 655f 5f37 6973 7472 6561 6d46 5055 6369 6320 7065 656b 5f5f 3769 7374 7265 616d 4676 2069 676e 6f72 655f 5f37
3126420 6973 7472 6561 6d46 6954 3120 5c00 7265 6164 5f5f 3769 7374 7265 616d 4650 6369 2072 6561 645f 5f37 6973 7472 6561 6d46
3126500 5055 6369 2067 636f 756e 745f 5f37 6973 7472 6561 6d46 7620 7075 7462 6163 6b5f 5f37 6973 7472 6561 6d46 6320 7379 6e63
3126560 5f5f 3769 7374 7265 616d 4676 2064 6f5f 6970 6678 5f5f 3769 7374 7265 616d 4669 2065 6174 7768 6974 655f 5f37 6973 7472
3126640 6561 6d46 7620 7967 6574 5f5f 3769 7374 7265 616d 4650 6320 3b3b 3b00 6f73 7472 6561 6d3a 5428 302c 3236 293d 7336 385f
3126720 5f76 7074 725f 5f37 6f73 7472 6561 6d3a 2830 2c33 3029 2c30 2c33 323b 5069 6f73 3a28 302c 3333 292c 3332 2c33 323b 4f69
3127000 6f73 3a28 302c 3233 292c 3634 2c34 3830 3b3b 006f 7374 7265 616d 3a5a 636f 7374 7265 616d 3b69 6f73 3b5f 5f63 745f 5f37
3127060 6f73 7472 6561 6d46 5039 7374 7265 616d 6275 6620 5f5f 6374 5f5f 376f 7374 7265 616d 4676 205f 5f63 745f 5f37 6f73 7472
3127140 6561 6d46 6920 5f5f 6374 5f5f 376f 7374 7265 616d 4669 5063 205f 5f63 745f 5f37 6f73 7472 6561 6d46 5237 6f73 7472 6561
3127220 6d20 5f5f 6474 5f5f 376f 7374 7265 616d 4676 206f 7066 785f 5f37 6f73 7472 6561 6d46 7620 6f73 6678 5f5f 376f 7374 7265
3127300 616d 4676 2066 6c75 7368 5f5f 376f 7374 7265 616d 4676 205c 0073 6565 6b70 5f5f 376f 7374 7265 616d 466c 2073 6565 6b70
3127360 5f5f 376f 7374 7265 616d 466c 3873 6565 6b5f 6469 7220 7465 6c6c 705f 5f37 6f73 7472 6561 6d46 7620 7075 745f 5f37 6f73
3127440 7472 6561 6d46 6320 5f5f 6c73 5f5f 376f 7374 7265 616d 4663 205f 5f6c 735f 5f37 6f73 7472 6561 6d46 5563 205f 5f6c 735f
3127520 5f37 6f73 7472 6561 6d46 5043 6320 5f5f 6c73 5f5f 376f 7374 7265 616d 4669 205f 5f6c 735f 5f37 6f73 7472 6561 6d46 6c20
3127600 5f5f 6c73 5f5f 376f 7374 7265 616d 4664 205f 5f6c 735f 5f37 6f73 7472 6561 6d46 6620 5c00 5f5f 6c73 5f5f 376f 7374 7265
3127660 616d 4655 6920 5f5f 6c73 5f5f 376f 7374 7265 616d 4655 6c20 5f5f 6c73 5f5f 376f 7374 7265 616d 4650 7620 5f5f 6c73 5f5f
3127740 376f 7374 7265 616d 4650 3973 7472 6561 6d62 7566 205f 5f6c 735f 5f37 6f73 7472 6561 6d46 7320 5f5f 6c73 5f5f 376f 7374
3130020 7265 616d 4655 7320 5f5f 6c73 5f5f 376f 7374 7265 616d 4650 4652 376f 7374 7265 616d 5f52 376f 7374 7265 616d 205f 5f6c
```

```
3130100 735f 5f37 6f73 7472 6561 6d46 5046 5233 696f 735f 5233 696f 7320 7772 6974 655f 5f37 6f73 7472 6561 6d46 5043 6369 205c
3130160 0077 7269 7465 5f5f 376f 7374 7265 616d 4650 4355 6369 2064 6f5f 6f70 6678 5f5f 376f 7374 7265 616d 4676 2064 6f5f 6f73
3130240 6678 5f5f 376f 7374 7265 616d 4676 203b 3b3b 0070 7574 5f5f 376f 7374 7265 616d 4663 3a66 2830 2c33 3429 3d2a 2830 2c32
3130320 3629 005f 5f30 7468 6973 3a70 2830 2c33 3429 005f 5f30 633a 7028 302c 3229 002f 7573 722f 4343 2f73 756e 342f 696e 636c
3130400 2f69 6f73 7472 6561 6d2e 6800 5f5f 3074 6869 733a 7228 302c 3334 2900 5f5f 3074 6869 7320 3a5a 746c 005f 5f30 6320 3a5a
3130460 746c 0070 7574 5f5f 376f 7374 7265 616d 4663 203a 5a74 4600 696f 7374 7265 616d 3a54 2830 2c33 3529 3d73 3830 785f 6763
3130540 6f75 6e74 5f5f 3769 7374 7265 616d 3a28 302c 3129 2c30 2c33 323b 5f5f 7670 7472 5f5f 3769 7374 7265 616d 3a28 302c 3330
3130620 292c 3332 2c33 323b 5069 6f73 3a28 302c 3333 292c 3634 2c33 323b 4f6f 7374 7265 616d 3a28 302c 3236 292c 3936 2c35 3434
3130700 3b3b 0069 6f73 7472 6561 6d3a 5a63 696f 7374 7265 616d 3b69 7374 7265 616d 206f 7374 7265 616d 2069 6f73 3b5f 5f63 745f
3130760 5f38 696f 7374 7265 616d 4650 3973 7472 6561 6462 7566 205f 5f63 745f 5f38 696f 7374 7265 616d 4676 205f 5f63 745f 5f38
3131040 696f 7374 7265 616d 4652 3869 6f73 7472 6561 6d20 5f5f 6474 5f5f 3969 6f73 7472 6561 6d46 7620 3b3b 3b00 6369 6e3a 4728
3131120 302c 3336 293d 7873 6973 7472 6561 6d5f 7769 7468 6173 7369 676e 3a00 636f 7574 3a47 2830 2c33 3729 3d78 736f 7374 7265
3131200 616d 5f77 6974 6861 7373 6967 6e3a 0063 6572 723a 4728 302c 3337 2900 636c 6f67 3a47 2830 2c33 3729 0049 6f73 7472 6561
3131260 6d5f 696e 6974 3a54 2830 2c33 3829 3d73 315f 5f57 395f 5f31 3349 6f73 7472 6561 6d5f 696e 6974 3a28 302c 3229 2c30 2c38
3131340 3b3b 0073 7464 7374 6174 7573 5f5f 3133 496f 7374 7265 616d 5f69 6e69 743a 4728 302c 3129 0069 6e69 7463 6f75 6e74 5f5f
3131420 3133 496f 7374 7265 616d 5f69 6e69 743a 4728 302c 3129 0049 6f73 7472 6561 6d5f 696e 6974 3a5a 6349 6f73 7472 6561 6d5f
3131500 696e 6974 3b3b 5f5f 6374 5f5f 3133 496f 7374 7265 616d 5f69 6e69 7446 7620 5f5f 6474 5f5f 3133 496f 7374 7265 616d 5f69
3131560 6e69 7446 7620 3b73 7464 7374 6174 7573 5f5f 3133 496f 7374 7265 616d 5f69 6e69 7420 696e 6974 636f 756e 745f 5f31 3349
3131640 6f73 7472 6561 615f 696e 6974 203b 4069 6f73 3b00 696f 7374 7265 616d 5f69 6e69 743a 5328 302c 3338 2900 4750 543a 7428
3131720 302c 3133 2900 736d 616e 6970 5f69 6e74 3a54 2830 2c33 3929 3d73 3866 6374 5f5f 3130 736d 616e 6970 5f69 6e74 3a28 302c
3132000 3430 293d 2a28 302c 3431 293d 6628 302c 3331 292c 302c 3332 3b61 7267 5f5f 3130 736d 616e 6970 5f69 6e74 3a28 302c 3129
3132060 2c33 322c 3332 3b3b 0073 6d61 6e69 705f 696e 743a 5a63 7361 616e 6970 5f69 6e74 3b3b 5f5f 6374 5f5f 3130 736d 616e 6970
3132140 5f69 6e74 4650 4652 3369 6f73 695f 5233 696f 7369 203b 3b5f 5f6c 735f 5f46 5237 6f73 7472 6561 6d52 3130 736d 616e 6970
3132220 5f69 6e74 205f 5f72 735f 5f46 5237 6973 7472 6561 6d52 3130 736d 616e 6970 5f69 6e74 203b 0073 6170 706c 795f 696e 743a
3132300 5428 302c 3432 293d 7334 6663 745f 5f31 3073 6170 706c 795f 696e 743a 2830 2c34 3029 2c30 2c33 323b 3b00 7361 7070 6c79
3132360 5f69 6e74 3a5a 6373 6170 706c 795f 696e 743b 3b5f 5f63 745f 5f31 3073 6170 706c 795f 696e 7446 5046 5233 696f 7369 5f52
3132440 3369 6f73 205f 5f63 6c5f 5f31 3073 6170 706c 795f 696e 7446 6920 3b3b 3b00 696d 616e 6970 5f69 6e74 3a54 2830 2c34 3329
3132520 3d73 3866 6374 5f5f 3130 696d 616e 6970 5f69 6e74 3a28 302c 3434 293d 2a28 302c 3435 293d 6628 302c 3436 293d 2a28 302c
3132600 3332 292c 302c 3332 3b61 7267 5f5f 3130 696d 616e 6970 5f69 6e74 3a28 302c 3129 2c33 322c 3332 3b3b 0069 6d61 6e69 705f
3132660 696e 743a 5a63 696d 616e 6970 5f69 6e74 3b3b 5f5f 6374 5f5f 3130 696d 616e 6970 5f69 6e74 4650 4652 3769 7374 7265 616d
3132740 695f 5237 6973 7472 6561 6d69 203b 3b5f 5f72 735f 5f46 5237 6973 7472 6561 6d52 3130 696d 616e 6970 5f69 6e74 203b 0069
3133020 6170 706c 795f 696e 743a 5428 302c 3437 293d 7334 6663 745f 5f31 3069 6170 706c 795f 696e 743a 2830 2c34 3429 2c30 2c33
3133100 323b 3b00 6961 7070 6c79 5f69 6e74 3a5a 6369 6170 706c 795f 696e 743b 3b5f 5f63 745f 5f31 3069 6170 706c 795f 696e 7446
3133160 5046 5237 6973 7472 6561 6d69 5f52 3769 7374 7265 616d 205f 5f63 6c5f 5f31 3069 6170 706c 795f 696e 7446 6920 3b3b 3b00
3133240 5f6d 616e 6970 5f69 6e74 3a54 2830 2c34 3829 3d73 3866 6374 5f5f 3130 6f6d 616e 6970 5f69 6e74 3a28 302c 3439 293d 2a28
3133320 302c 3530 293d 6628 302c 3334 292c 302c 3332 3b61 7267 5f5f 3130 6f6d 616e 6970 5f69 6e74 3a28 302c 3129 2c33 322c 3332
3133400 3b3b 006f 6d61 6e69 705f 696e 743a 5a63 6f6d 616e 6970 5f69 6e74 3b3b 5f5f 6374 5f5f 3130 6f6d 616e 6970 5f69 6e74 4650
3133460 4652 376f 7374 7265 616d 695f 5237 6f73 7472 6561 6d69 203b 3b5f 5f6c 735f 5f46 5237 6f73 7472 6561 6d52 3130 6f6d 616e
3133540 6970 5f69 6e74 203b 006f 6170 706c 795f 696e 743a 5428 302c 3531 293d 7334 6663 745f 5f31 306f 6170 706c 795f 696e 743a
3133620 2830 2c34 3929 2c30 2c33 323b 3b00 6f61 7070 6c79 5f69 6e74 3a5a 636f 6170 706c 795f 696e 743b 3b5f 5f63 745f 5f31 306f
3133700 6170 706c 795f 696e 7446 5046 5237 6f73 7472 6561 6d69 5f52 376f 7374 7265 616d 205f 5f63 6c5f 5f31 306f 6170 706c 795f
3133760 696e 7446 6920 3b3b 3b00 696f 6161 6e69 705f 696e 743a 5428 302c 3532 293d 7338 6663 745f 5f31 3169 6f6d 616e 6970 5f69
3134040 6e74 3a28 302c 3533 293d 2a28 302c 3534 293d 6628 302c 3535 293d 2a28 302c 3335 292c 302c 3332 3b61 7267 5f5f 3131 696f
3134120 6d61 6e69 705f 696e 743a 2830 2c31 292c 3332 2c33 323b 3b00 696f 6d61 6e69 705f 696e 743a 5a63 696f 6d61 6e69 705f 696e
3134200 743b 3b5f 5f63 745f 5f31 3169 6f6d 616e 6970 5f69 6e74 4650 4652 3869 6f73 7472 6561 6d69 5f52 3869 6f73 7472 6561 6d69
3134260 203b 3b5f 5f6c 735f 5f46 5238 696f 7374 7265 616d 5231 3169 6f6d 616e 6970 5f69 6e74 205f 5f72 735f 5f46 5238 696f 7374
3134340 7265 616d 5231 3169 6f6d 616e 6970 5f69 6e74 203b 0069 6f61 7070 6c79 5f69 6e74 3a54 2830 2c35 3629 3d73 3466 6374 5f5f
3134420 3131 696f 6170 706c 795f 696e 743a 2830 2c35 3329 2c30 2c33 323b 3b00 696f 6170 706c 795f 696e 743a 5a63 696f 6170 706c
3134500 795f 696e 743b 3b5f 5f63 745f 5f31 3169 6f61 7070 6c79 5f69 6e74 4650 4652 3869 6f73 7472 6561 6d69 5f52 3869 6f73 7472
3134560 6561 6d20 5f5f 636c 5f5f 3131 696f 6170 706c 795f 696e 7446 6920 3b3b 3b00 736d 616e 6970 5f6c 6f6e 673a 5428 302c 3537
3134640 293d 7338 6663 745f 5f31 3173 6d61 6e69 705f 6c6f 6e67 3a28 302c 3430 292c 302c 3332 3b61 7267 5f5f 3131 736d 616e 6970
3134720 5f6c 6f6e 673a 2830 2c31 292c 3332 2c33 323b 3b00 736d 616e 6970 5f6c 6f6e 673a 5a63 736d 616e 6970 5f6c 6f6e 673b 3b5f
3135000 5f63 745f 5f31 3173 6d61 6e69 705f 6c6f 6e67 4650 4652 3369 6f73 6c5f 5233 696f 736c 203b 3b5f 5f6c 735f 5f46 5237 6f73
3135060 7472 6561 6d52 3131 736d 616e 6970 5f6c 6f6e 6720 5f5f 7273 5f5f 4652 3769 7374 7265 616d 5231 3173 6d61 6e69 705f 6c6f
3135140 6e67 203b 0073 6170 706c 795f 6c6f 6e67 3a54 2830 2c35 3829 3d73 3466 6374 5f5f 3131 7361 7070 6c79 5f6c 6f6e 673a 2830
```

```
3135220 2c34 3029 2c30 2c33 323b 3b00 7361 7070 6c79 5f6c 6f6e 673a 5a63 7361 7070 6c79 5f6c 6f6e 673b 3b5f 5f63 745f 5f31 3173
3135300 6170 706c 795f 6c6f 6e67 4650 4652 3369 6f73 6c5f 5233 696f 7320 5f5f 636c 5f5f 3131 7361 7070 6c79 5f6c 6f6e 6746 6c20
3135360 3b3b 3b00 696d 616e 6970 5f6c 6f6e 673a 5428 302c 3539 293d 7338 6663 745f 5f31 3169 6d61 6e69 705f 6c6f 6e67 3a28 302c
3135440 3434 292c 302c 3332 3b61 7267 5f5f 3131 696d 616e 6970 5f6c 6f6e 673a 2830 2c31 292c 3332 2c33 323b 3b00 696d 616e 6970
3135520 5f6c 6f6e 673a 5a63 696d 616e 6970 5f6c 6f6e 673b 3b5f 5f63 745f 5f31 3169 6d61 6e69 705f 6c6f 6e67 4650 4652 3769 7374
3135600 7265 616d 6c5f 5237 6973 7472 6561 6d6c 203b 3b5f 5f72 735f 5f46 5237 6973 7472 6561 6d52 3131 696d 616e 6970 5f6c 6f6e
3135660 6720 3b00 6961 7070 6c79 5f6c 6f6e 673a 5428 302c 3630 293d 7334 6663 745f 5f31 3169 6170 706c 795f 6c6f 6e67 3a28 302c
3135740 3434 292c 302c 3332 3b3b 0069 6170 706c 795f 6c6f 6e67 3a5a 6369 6170 706c 795f 6c6f 6e67 3b3b 5f5f 6374 5f5f 3131 6961
3136020 7070 6c79 5f6c 6f6e 6746 5046 5237 6973 7472 6561 6d6c 5f52 3769 7374 7265 616d 205f 5f63 6c5f 5f31 3169 6170 706c 795f
3136100 6c6f 6e67 466c 203b 3b3b 006f 6d61 6e69 705f 6c6f 6e67 3a54 2830 2c36 3129 3d73 3866 6374 5f5f 3131 6f6d 616e 6970 5f6c
3136160 6f6e 673a 2830 2c34 3929 2c30 2c33 323b 6172 675f 5f31 316f 6d61 6e69 705f 6c6f 6e67 3a28 302c 3129 2c33 322c 3332 3b3b
3136240 006f 6d61 6e69 705f 6c6f 6e67 3a5a 636f 6d61 6e69 705f 6c6f 6e67 3b3b 5f5f 6374 5f5f 3131 6f6d 616e 6970 5f6c 6f6e 6746
3136320 5046 5237 6f73 7472 6561 6d6c 5f52 376f 7374 7265 616d 6c20 3b3b 5f5f 6c73 5f5f 4652 376f 7374 7265 616d 5231 316f 6d61
3136400 6e69 705f 6c6f 6e67 203b 006f 6170 706c 795f 6c6f 6e67 3a54 2830 2c36 3229 3d73 3466 6374 5f5f 3131 6f61 7070 6c79 5f6c
3136460 6f6e 673a 2830 2c34 3929 2c30 2c33 323b 3b00 6f61 7070 6c79 5f6c 6f6e 673a 5a63 6f61 7070 6c79 5f6c 6f6e 673b 3b5f 5f63
3136540 745f 5f31 316f 6170 706c 795f 6c6f 6e67 4650 4652 376f 7374 7265 616d 6c5f 5237 6f73 7472 6561 6d20 5f5f 636c 5f5f 3131
3136620 6f61 7070 6c79 5f6c 6f6e 6746 6c20 3b3b 3b00 696f 6d61 6e69 705f 6c6f 6e67 3a54 2830 2c36 3329 3d73 3866 6374 5f5f 3132
3136700 696f 6d61 6e69 705f 6c6f 6e67 3a28 302c 3533 292c 302c 3332 3b61 7267 5f5f 3132 696f 6d61 6e69 705f 6c6f 6e67 3a28 302c
3136760 3129 2c33 322c 3332 3b3b 0069 6f6d 616e 6970 5f6c 6f6e 673a 5a63 696f 6d61 6e69 705f 6c6f 6e67 3b3b 5f5f 6374 5f5f 3132
3137040 696f 6d61 6e69 705f 6c6f 6e67 4650 4652 3869 6f73 7472 6561 6d6c 5f52 3869 6f73 7472 6561 6d6c 203b 3b5f 5f6c 735f 5f46
3137120 5238 696f 7374 7265 616d 5231 3269 6f6d 616e 6970 5f6c 6f6e 6720 5f5f 7273 5f5f 4652 3869 6f73 7472 6561 6d52 3132 696f
3137200 6d61 6e69 705f 6c6f 6e67 203b 0069 6f61 7070 6c79 5f6c 6f6e 673a 5428 302c 3634 293d 7334 6663 745f 5f31 3269 6f61 7070
3137260 6c79 5f6c 6f6e 673a 2830 2c35 3329 2c30 2c33 323b 3b00 696f 6170 706c 795f 6c6f 6e67 3a5a 6369 6f61 7070 6c79 5f6c 6f6e
3137340 673b 3b5f 5f63 745f 5f31 3269 6f61 7070 6c79 5f6c 6f6e 6746 5046 5238 696f 7374 7265 616d 6c5f 5238 696f 7374 7265 616d
3137420 205f 5f63 6c5f 5f31 3269 6f61 7070 6c79 5f6c 6f6e 6746 6c20 3b3b 3b00 6572 726e 6f3a 4728 302c 3129 0073 7973 5f6e 6572
3137500 723a 4728 302c 3129 0073 7464 696f 6275 663a 5428 302c 3636 293d 7335 3261 6c6c 6f63 5f5f 3973 7472 6561 6d62 7566 3a28
3137560 302c 3429 2c30 2c31 363b 785f 756e 6275 665f 5f39 7374 7265 616d 6275 663a 2830 2c34 292c 3136 2c31 363b 785f 6261 7365
3137640 5f5f 3973 7472 6561 6d62 7566 3a28 302c 3331 292c 3332 2c33 323b 785f 7062 6173 655f 5f39 7374 7265 616d 6275 663a 2830
3137720 2c33 3129 2c36 342c 3332 3b78 5f70 7074 725f 5f39 7374 7265 616d 6275 663a 2830 2c33 3129 2c39 362c 3332 3b78 5f65 7070
3140000 7472 5f5f 3973 7472 6561 6d62 7566 3a28 302c 3331 292c 3132 382c 3332 3b78 5f67 7074 725f 5f39 7374 7265 616d 6275 663a
3140060 2830 2c33 3129 2c31 3630 2c33 323b 785f 6567 7074 725f 5f39 7374 7265 616d 6275 663a 2830 2c33 3129 2c31 3932 2c33 323b
3140140 5c00 785f 6562 6163 6b5f 5f39 7374 7265 616d 6275 663a 2830 2c33 3129 2c32 3234 2c33 323b 785f 626c 656e 5f5f 3973 7472
3140220 6561 6d62 7566 3a28 302c 3129 2c32 3536 2c33 323b 5f5f 7670 7472 5f5f 3973 7472 6561 6d62 7566 3a28 302c 3330 292c 3238
3140300 382c 3332 3b66 705f 5f38 7374 6469 6f62 7566 3a28 302c 3637 293d 2a28 302c 3635 293d 7873 5f69 6f62 7566 3a2c 3332 302c
3140360 3332 3b6c 6173 745f 6f70 5f5f 3873 7464 696f 6275 663a 2830 2c31 292c 3335 322c 3332 3b62 7566 5f5f 3873 7464 696f 6275
3140440 663a 2830 2c36 3829 3d61 7228 302c 3129 3b30 3b31 3b28 302c 3229 2c33 3834 2c31 363b 3b00 7374 6469 6f62 7566 3a5a 6373
3140520 7464 696f 6275 663b 7374 7265 616d 6275 663b 6f76 6572 666c 6f77 5f5f 3873 7464 696f 6275 6646 6920 756e 6465 7266 6c6f
3140600 775f 5f38 7374 6469 6f62 7566 4676 2073 796e 635f 5f38 7374 6469 6f62 7566 4676 2073 6565 6b6f 6666 5f5f 3873 7464 696f
3140660 6275 6646 6c38 7365 656b 5f64 6972 6920 7062 6163 6b66 6169 6c5f 5f38 7374 6469 6f62 7566 4669 205f 5f63 745f 5f38 7374
3140740 6469 6f62 7566 4650 365f 696f 6275 6620 5f5f 6374 5f5f 3873 7464 696f 6275 6646 5243 3873 7464 696f 6275 6620 5c00 7374
3141020 6469 6f66 696c 655f 5f38 7374 6469 6f62 7566 4676 205f 5f64 745f 5f38 7374 6469 6f62 7566 4676 203b 3b3b 0066 696c 6562
3141100 7566 3a54 2830 2c36 3929 3d73 3634 616c 6c6f 635f 5f39 7374 7265 616d 6275 663a 2830 2c34 292c 302c 3136 3b78 5f75 6e62
3141160 7566 5f5f 3973 7472 6561 6d62 7566 3a28 302c 3429 2c31 362c 3136 3b78 5f62 6173 655f 5f39 7374 7265 616d 6275 663a 2830
3141240 2c33 3129 2c33 322c 3332 3b78 5f70 6261 7365 5f5f 3973 7472 6561 6d62 7566 3a28 302c 3331 292c 3634 2c33 323b 785f 7070
3141320 7472 5f5f 3973 7472 6561 6d62 7566 3a28 302c 3331 292c 3936 2c33 323b 785f 6570 7074 725f 5f39 7374 7265 616d 6275 663a
3141400 2830 2c33 3129 2c31 3238 2c33 323b 795f 6770 7472 5f5f 3973 7472 6561 6d62 7566 3a28 302c 3331 292c 3136 302c 3332 3b78
3141460 5f65 6770 7472 5f5f 3973 7472 6561 6d62 7566 3a28 302c 3331 292c 3139 322c 3332 3b5c 0078 5f65 6261 636b 5f5f 3973 7472
3141540 6561 6d62 7566 3a28 302c 3331 292c 3232 342c 3332 3b78 5f62 6c65 6e5f 5f39 7374 7265 616d 6275 663a 2830 2c31 292c 3235
3141620 362c 3332 3b5f 5f76 7074 725f 5f39 7374 7265 616d 6275 663a 2830 2c33 3029 2c32 3838 2c33 323b 7866 645f 5f37 6669 6c65
3141700 6275 663a 2830 2c31 292c 3332 302c 3332 3b6d 6f64 655f 5f37 6669 6c65 6275 663a 2830 2c31 292c 3335 322c 3332 3b6f 7065
3141760 6e65 645f 5f37 6669 6c65 6275 663a 2830 2c32 292c 3338 342c 393b 6c61 7374 5f73 6565 6b5f 5f37 6669 6c65 6275 663a 2830
3142040 2c31 292c 3431 362c 3332 3b69 6e5f 7374 6172 745f 5f37 6669 6c65 6275 663a 2830 2c33 3129 2c34 3438 2c33 323b 6c61 6865
3142120 6164 5f5f 3766 696c 6562 7566 3a28 302c 3638 292c 3438 302c 3136 3b3b 006f 7065 6e70 726f 745f 5f37 6669 6c65 6275 663a
3142200 4728 302c 3129 0066 696c 6562 7566 3a5a 6366 696c 6562 7566 3b73 7472 6561 6d62 7566 3b5f 5f63 745f 5f37 6669 6c65 6275
3142260 6646 7620 5f5f 6374 5f5f 3766 696c 6562 7566 4669 205f 5f63 745f 5f37 6669 6c65 6275 6646 6950 6354 3120 5f5f 6374 5f5f
```

| | | | | | | | | | | | | | | | | | | | | | | | | |
|---|---|---|---|---|---|---|---|---|---|---|---|---|---|---|---|---|---|---|---|---|---|---|---|---|
| 3142340 | 3766 | 696c | 6562 | 7566 | 4652 | 4337 | 6669 | 6c65 | 6275 | 6620 | 6973 | 5f6f | 7065 | 6e5f | 5f37 | 6669 | 6c65 | 6275 | 6646 | 7620 | 6664 | 5f5f | 3766 | 696c |
| 3142420 | 6562 | 7566 | 4676 | 206f | 7065 | 6e5f | 5f37 | 6669 | 6c65 | 6275 | 6646 | 5043 | 6369 | 5432 | 2061 | 7474 | 6163 | 685f | 5f37 | 6669 | 6c65 | 6275 | 6646 | 6920 |
| 3142500 | 636c | 6f73 | 655f | 5f37 | 6669 | 6c65 | 6275 | 6646 | 7620 | 5c00 | 5f5f | 6474 | 5f5f | 3766 | 696c | 6562 | 7566 | 4676 | 206f | 7665 | 7266 | 6c6f | 775f | 5f37 |
| 3142560 | 6669 | 6c65 | 6275 | 6646 | 6920 | 756e | 6465 | 7266 | 6c6f | 775f | 5f37 | 6669 | 6c65 | 6275 | 6646 | 7620 | 7379 | 6e63 | 5f5f | 3766 | 696c | 6562 | 7566 | 4676 |
| 3142640 | 2073 | 6565 | 6b6f | 6666 | 5f5f | 3766 | 696c | 6562 | 7566 | 466c | 3873 | 6565 | 6b5f | 6467 | 7269 | 2073 | 6574 | 6275 | 665f | 5f37 | 6669 | 6c65 | 6275 | 6646 |
| 3142720 | 5063 | 6920 | 6c61 | 7374 | 5f6f | 705f | 5f37 | 6669 | 6c65 | 6275 | 6646 | 7620 | 3b6f | 7065 | 6e70 | 726f | 745f | 5f37 | 6669 | 6c65 | 6275 | 6620 | 3b3b | 0066 |
| 3143000 | 7374 | 7265 | 616d | 6261 | 7365 | 3a54 | 2830 | 2c37 | 3029 | 3d73 | 3133 | 3262 | 7566 | 5f5f | 3131 | 6673 | 7472 | 6561 | 6462 | 6173 | 653a | 2830 | 2c36 | 3929 |
| 3143060 | 2c30 | 2c35 | 3132 | 3b5f | 5f76 | 7074 | 725f | 5f31 | 3166 | 7374 | 7265 | 616d | 6261 | 7365 | 3a28 | 302c | 3330 | 292c | 3531 | 322c | 3332 | 3b50 | 696f | 733a |
| 3143140 | 2830 | 2c33 | 3329 | 2c35 | 3434 | 2c33 | 323b | 4f69 | 6f73 | 3a28 | 302c | 3233 | 292c | 3537 | 362c | 3438 | 303b | 3b00 | 6673 | 7472 | 6561 | 6d62 | 6173 | 653a |
| 3143220 | 5a63 | 6673 | 7472 | 6561 | 6d62 | 6173 | 653b | 696f | 733b | 5f5f | 6374 | 5f5f | 3131 | 6673 | 7472 | 6561 | 6d62 | 6173 | 6546 | 7620 | 5f5f | 6374 | 5f5f | 3131 |
| 3143300 | 6673 | 7472 | 6561 | 6462 | 6173 | 6546 | 5043 | 6369 | 5432 | 205f | 5f63 | 745f | 5f31 | 3166 | 7374 | 7265 | 616d | 6261 | 7365 | 4669 | 205f | 5f63 | 745f | 5f31 |
| 3143360 | 3166 | 7374 | 7265 | 616d | 6261 | 7365 | 4669 | 5063 | 5431 | 205f | 5f63 | 745f | 5f31 | 3166 | 7374 | 7265 | 616d | 6261 | 7365 | 4652 | 3131 | 6673 | 7472 | 6561 |
| 3143440 | 6d62 | 6173 | 6520 | 5f5f | 6474 | 5f5f | 3131 | 6673 | 7472 | 6561 | 6d62 | 6173 | 6546 | 7620 | 6f70 | 656e | 5f5f | 3131 | 6673 | 7472 | 6561 | 6d62 | 6173 | 6546 |
| 3143520 | 5043 | 6369 | 5432 | 205c | 0061 | 7474 | 6163 | 685f | 5f31 | 3166 | 7374 | 7265 | 616d | 6261 | 7365 | 4669 | 2063 | 6c6f | 7365 | 5f5f | 3131 | 6673 | 7472 | 6561 |
| 3143600 | 6d62 | 6173 | 6546 | 7620 | 7365 | 7462 | 7566 | 5f5f | 3131 | 6673 | 7472 | 6561 | 6d62 | 6173 | 6546 | 5063 | 6920 | 7264 | 6275 | 665f | 5f31 | 3166 | 7374 | 7265 |
| 3143660 | 616d | 6261 | 7365 | 4676 | 2076 | 6572 | 6966 | 795f | 5f31 | 3166 | 7374 | 7265 | 616d | 6261 | 7365 | 4669 | 203b | 3b3b | 0073 | 7461 | 7465 | 5f76 | 616c | 7565 |
| 3143740 | 3a74 | 2830 | 2c31 | 3829 | 004f | 626a | 6563 | 743a | 5428 | 302c | 3731 | 293d | 7334 | 5f5f | 7670 | 7472 | 5f5f | 364f | 626a | 6563 | 743a | 2830 | 2c33 | 3029 |
| 3144020 | 2c30 | 2c33 | 323b | 3b00 | 4f62 | 6a65 | 6374 | 3a5a | 634f | 626a | 6563 | 743b | 3b5f | 5f63 | 745f | 5f36 | 4f62 | 6a65 | 6374 | 4676 | 205f | 5f63 | 745f | 5f36 |
| 3144100 | 4f62 | 6a65 | 6374 | 4652 | 4336 | 4f62 | 6a65 | 6374 | 2065 | 7272 | 6f72 | 4d65 | 6d6f | 7279 | 5f5f | 364f | 626a | 6563 | 7446 | 5063 | 5431 | 2065 | 7870 | 6c61 |
| 3144160 | 696e | 5f5f | 364f | 626a | 6563 | 7446 | 5063 | 2069 | 6e4f | 7264 | 6572 | 5f5f | 364f | 626a | 6563 | 7446 | 5036 | 4f62 | 6a65 | 6374 | 203b | 3b3b | 005f | 5f70 |
| 3144240 | 7462 | 6c5f | 5f36 | 4f62 | 6a65 | 6374 | 5f5f | 4f62 | 6a65 | 6374 | 5f64 | 625f | 6378 | 783a | 4728 | 302c | 3330 | 2900 | 5046 | 3a74 | 2830 | 2c31 | 3529 | 0050 |
| 3144320 | 4643 | 3a74 | 2830 | 2c31 | 3529 | 0050 | 4649 | 3a74 | 2830 | 2c31 | 3529 | 0065 | 7272 | 6f72 | 4d65 | 6d6f | 7279 | 5f5f | 364f | 626a | 6563 | 7446 | 5063 | 5431 |
| 3144400 | 3a46 | 2830 | 2c32 | 2900 | 5f5f | 3074 | 6869 | 733a | 7028 | 302c | 3732 | 293d | 2a28 | 302c | 3731 | 2900 | 5f5f | 3073 | 313a | 7028 | 302c | 3331 | 2900 | 5f5f |
| 3144460 | 3073 | 323a | 7028 | 302c | 3331 | 2900 | 4f62 | 6a65 | 6374 | 5f64 | 622e | 6378 | 7800 | 5f5f | 3074 | 6869 | 7320 | 3a5a | 746c | 005f | 5f30 | 7331 | 203a | 5a74 |
| 3144540 | 6c00 | 5f5f | 3073 | 3220 | 3a5a | 746c | 0065 | 7272 | 6f72 | 4d65 | 6d6f | 7279 | 5f5f | 364f | 626a | 6563 | 7446 | 5063 | 5431 | 203a | 5a74 | 4600 | 6578 | 706c |
| 3144620 | 6169 | 6e5f | 5f36 | 4f62 | 6a65 | 6374 | 4650 | 633a | 4628 | 302c | 3229 | 005f | 5f30 | 7468 | 6973 | 3a70 | 2830 | 2c37 | 3229 | 005f | 5f30 | 733a | 7028 | 302c |
| 3144700 | 3331 | 2900 | 5f5f | 3074 | 6869 | 7320 | 3a5a | 746c | 005f | 5f30 | 7320 | 3a5a | 746c | 0065 | 7870 | 6c61 | 696e | 5f5f | 364f | 626a | 6563 | 7446 | 5063 | 203a |
| 3144760 | 5a74 | 4600 | 5f5f | 7374 | 695f | 5f4f | 626a | 6563 | 745f | 6462 | 5f63 | 7878 | 5f65 | 7272 | 6f72 | 4d65 | 6d6f | 7279 | 5f3a | 4628 | 302c | 3229 | 002f | 7573 |
| 3145040 | 722f | 4343 | 2f73 | 756e | 342f | 696e | 636c | 2f69 | 6f73 | 7472 | 6561 | 6d2e | 6800 | 5f5f | 7374 | 645f | 5f4f | 626a | 6563 | 745f | 6462 | 5f63 | 7878 | 5f65 |
| 3145120 | 7272 | 6f72 | 4d65 | 6d6f | 7279 | 5f3a | 4628 | 302c | 3229 | 005f | 5f76 | 7462 | 6c5f | 5f36 | 4f62 | 6a65 | 6374 | 3a47 | 2830 | 2c37 | 3329 | 3d61 | 7228 | 302c |
| 3145200 | 3129 | 3b30 | 3b33 | 3b28 | 302c | 3135 | 2900 | 696e | 4f72 | 6465 | 725f | 5f36 | 4f62 | 6a65 | 6374 | 4650 | 364f | 626a | 6563 | 743a | 6628 | 302c | 3129 | 005f |
| 3145260 | 5f30 | 7468 | 6973 | 3a70 | 2830 | 2c37 | 3229 | 005f | 5f30 | 5f5f | 4132 | 373a | 7028 | 302c | 3732 | 2900 | 2e2f | 6878 | 782f | 4f62 | 6a65 | 6374 | 5f64 | 622e |
| 3145340 | 6878 | 7800 | 5f5f | 3074 | 6869 | 7320 | 3a5a | 746c | 005f | 5f30 | 5f5f | 4132 | 3720 | 3a5a | 746c | 0069 | 6e4f | 7264 | 6572 | 5f5f | 364f | 626a | 6563 | 7446 |
| 3145420 | 5036 | 4f62 | 6a65 | 6374 | 203a | 5a74 | 4600 | 504c | 6973 | 745f | 6462 | 2e6f | 005f | 7075 | 745f | 5f37 | 6f73 | 7472 | 6561 | 6d46 | 6300 | 5f69 | 6f73 | 7472 |
| 3145500 | 6561 | 6d5f | 696e | 6974 | 005f | 6578 | 706c | 6169 | 6e5f | 5f38 | 4c50 | 4f62 | 6a65 | 6374 | 4650 | 6300 | 5f69 | 6e4f | 7264 | 6572 | 5f5f | 364f | 626a | 6563 |
| 3145560 | 7446 | 5036 | 4f62 | 6a65 | 6374 | 002f | 686f | 6d65 | 2f6f | 7361 | 7331 | 2f61 | 2f61 | 622f | 7372 | 632f | 6e65 | 776f | 626a | 6563 | 7473 | 2f6c | 6973 | 7473 |
| 3145640 | 2f43 | 2b2b | 2e37 | 3934 | 372f | 0050 | 4c69 | 7374 | 5f64 | 622e | 6300 | 504c | 6973 | 745f | 6462 | 2e63 | 7878 | 0069 | 6e74 | 3a74 | 2830 | 2c31 | 293d | 7228 |
| 3145720 | 302c | 3129 | 3b2d | 3231 | 3437 | 3438 | 3336 | 3438 | 3b32 | 3134 | 3734 | 3833 | 3634 | 373b | 0063 | 6861 | 723a | 7428 | 302c | 3229 | 3d72 | 2830 | 2c32 | 293b |
| 3146000 | 303b | 3132 | 373b | 006c | 6f6e | 673a | 7428 | 302c | 3329 | 3d72 | 2830 | 2c31 | 293b | 2d32 | 3134 | 3734 | 3833 | 3634 | 383b | 3231 | 3437 | 3438 | 3336 | 3437 |
| 3146060 | 3b00 | 7368 | 6f72 | 743a | 7428 | 302c | 3429 | 3d72 | 2830 | 2c31 | 293b | 2d33 | 3237 | 3638 | 3b33 | 3237 | 3637 | 3b00 | 756e | 7369 | 676e | 6564 | 2063 | 6861 |
| 3146140 | 723a | 7428 | 302c | 3529 | 3d72 | 2830 | 2c31 | 293b | 303b | 3235 | 353b | 0075 | 6e73 | 6967 | 6e65 | 6420 | 7368 | 6f72 | 743a | 7428 | 302c | 3629 | 3d72 | 2830 |
| 3146220 | 2c31 | 293b | 303b | 3635 | 3533 | 353b | 0075 | 6e73 | 6967 | 6e65 | 6420 | 6c6f | 6e67 | 3a74 | 2830 | 2c37 | 293d | 7228 | 302c | 3129 | 3b30 | 3b2d | 313b | 0075 |
| 3146300 | 6e73 | 6967 | 6e65 | 6420 | 696e | 743a | 7428 | 302c | 3829 | 3d72 | 2830 | 2c31 | 293b | 303b | 2d31 | 3b00 | 666c | 6f61 | 743a | 7428 | 302c | 3929 | 3d72 | 2830 |
| 3146360 | 2c31 | 293b | 343b | 303b | 0064 | 6f75 | 626c | 653a | 7428 | 302c | 3130 | 293d | 7228 | 302c | 3129 | 3b38 | 3b30 | 3b00 | 766f | 6964 | 3a74 | 2830 | 2c31 | 3129 |
| 3146440 | 3d28 | 302c | 3131 | 2900 | 3f3f | 3f3a | 7428 | 302c | 3132 | 293d | 2830 | 2c31 | 2900 | 5f5f | 7670 | 7470 | 3a74 | 2830 | 2c31 | 3329 | 3d2a | 2830 | 2c31 | 3429 |
| 3146520 | 3d66 | 2830 | 2c31 | 2900 | 5f5f | 6d70 | 7472 | 3a54 | 2830 | 2c31 | 3529 | 3d73 | 3864 | 3a28 | 302c | 3429 | 2c30 | 2c31 | 363b | 693a | 2830 | 2c34 | 292c | 3136 |
| 3146600 | 2c31 | 363b | 663a | 2830 | 2c31 | 3329 | 2c33 | 322c | 3332 | 3b3b | 005f | 5046 | 565f | 3a74 | 2830 | 2c31 | 3629 | 3d2a | 2830 | 2c31 | 3729 | 3d66 | 2830 | 2c32 |
| 3146660 | 2900 | 5f50 | 4649 | 5f3a | 7428 | 302c | 3133 | 2900 | 7374 | 7265 | 616d | 706f | 733a | 7428 | 302c | 3129 | 0073 | 7472 | 6561 | 6d6f | 6666 | 3a74 | 2830 | 2c31 |
| 3146740 | 2900 | 696f | 5f73 | 7461 | 7465 | 3a54 | 2830 | 2c31 | 3829 | 3165 | 676f | 6f64 | 6269 | 745f | 5f69 | 6f5f | 7374 | 6174 | 653a | 302c | 656f | 6662 | 6974 | 5f5f |
| 3147020 | 696f | 5f73 | 7461 | 7465 | 3a31 | 2c66 | 6169 | 6c62 | 6974 | 5f5f | 696f | 5f73 | 7461 | 7465 | 3a32 | 2c62 | 6164 | 6269 | 745f | 5f69 | 6f5f | 7374 | 6174 | 653a |
| 3147100 | 332c | 6861 | 7264 | 6661 | 696c | 5f5f | 696f | 5f73 | 7461 | 7465 | 3a34 | 2c3b | 006f | 7065 | 6e5f | 6d6f | 6465 | 3a54 | 2830 | 2c31 | 3929 | 3d65 | 696e | 5f5f |
| 3147160 | 6f70 | 656e | 5f6d | 6f64 | 653a | 302c | 6f75 | 745f | 5f6f | 7065 | 6e5f | 6d6f | 6465 | 3a31 | 2c61 | 7465 | 5f5f | 6f70 | 656e | 5f6d | 6f64 | 653a | 322c | 6170 |
| 3147240 | 705f | 5f6f | 7065 | 6e5f | 6d6f | 6465 | 3a33 | 2c74 | 7275 | 6e63 | 5f5f | 6f70 | 656e | 5f6d | 6f64 | 653a | 342c | 6e6f | 6372 | 6561 | 7465 | 5f5f | 6f70 | 656e |
| 3147320 | 5f6d | 6f64 | 653a | 352c | 6e6f | 7265 | 706c | 6163 | 655f | 5f6f | 7065 | 6e5f | 6d6f | 6465 | 3a36 | 2c3b | 0073 | 6565 | 6b5f | 6469 | 723a | 5428 | 302c | 3230 |
| 3147400 | 293d | 6562 | 6567 | 5f5f | 7365 | 656b | 5f64 | 6972 | 3a30 | 2c63 | 7572 | 5f5f | 7365 | 656b | 5f64 | 6972 | 3a31 | 2c65 | 6e64 | 5f5f | 7365 | 656b | 5f64 | 6972 |

```
3147460 3a32 2c3b 005f 5f45 313a 5428 302c 3231 2933 6573 6b69 7077 735f 5f5f 5f45 313a 302c 6c65 6674 5f5f 5f5f 4531 3a31 2c72
3147540 6967 6874 5f5f 5f5f 4531 3a32 2c69 6e74 6572 6e61 6c5f 5f5f 5f45 313a 332c 6465 635f 5f5f 5f45 313a 342c 6f63 745f 5f5f
3147620 5f45 313a 352c 6865 785f 5f5f 5f45 313a 362c 7368 6f77 6261 7365 5f5f 5f5f 4531 3a37 2c5c 0073 686f 7770 6f69 6e74 5f5f
3147700 5f5f 4531 3a38 2c75 7070 6572 6361 7365 5f5f 5f5f 4531 3a39 2c73 686f 7770 6f73 5f5f 5f5f 4531 3a31 302c 7363 6965 6e74
3147760 6966 6963 5f5f 5f5f 4531 3a31 312c 6669 7865 645f 5f5f 5f45 313a 3132 2c75 6e69 7462 7566 5f5f 5f5f 4531 3a31 332c 7374
3150040 6469 6f5f 5f5f 5f45 313a 3134 2c3b 005f 5f45 323a 5428 302c 3232 293d 6573 6b69 7070 696e 675f 5f5f 5f45 323a 302c 7469
3150120 6564 5f5f 5f5f 4532 3a31 2c3b 0069 6f73 3a54 2830 2c32 3329 3d73 3630 6e75 7365 725f 5f33 696f 733a 2830 2c31 292c 302c
3150200 3332 3b78 5f75 7365 725f 5f33 696f 733a 2830 2c32 3729 3d2a 2830 2c32 3429 3d78 7569 6f73 5f75 7365 725f 756e 696f 6e3a
3150260 2c33 322c 3332 3b62 705f 5f33 696f 733a 2830 2c32 3829 3d2a 2830 2c32 3529 3d78 7373 7472 6561 6d62 7566 3a2c 3634 2c33
3150340 323b 7374 6174 655f 5f33 696f 733a 2830 2c31 292c 3936 2c33 323b 6973 7065 6369 616c 5f5f 3369 6f73 3a28 302c 3129 2c31
3150420 3238 2c33 323b 6f73 7065 6369 616c 5f5f 3369 6f73 3a28 302c 3129 2c31 3630 2c33 323b 6973 6678 5f73 7065 6369 616c 5f5f
3150500 3369 6f73 3a28 302c 3129 2c31 3932 2c33 323b 6f73 6678 5f73 7065 6369 616c 5f5f 3369 6f73 3a28 302c 3129 2c32 3234 2c33
3150560 323b 5c00 6465 6c62 7566 5f5f 3369 6f73 3a28 302c 3129 2c32 3536 2c33 323b 785f 7469 655f 5f33 696f 733a 2830 2c32 3929
3150640 3d2a 2830 2c32 3629 3d78 736f 7374 7265 616d 3a2c 3238 382c 3332 3b78 5f66 6c61 6773 5f5f 3369 6f73 3a28 302c 3129 2c33
3150720 3230 2c33 323b 785f 7072 6563 6973 696f 6e5f 5f33 696f 733a 2830 2c34 292c 3335 322c 3136 3b78 5f66 696c 6c5f 5f33 696f
3151000 733a 2830 2c32 292c 3336 382c 383b 785f 7769 6474 685f 5f33 696f 733a 2830 2c34 292c 3338 342c 3136 3b61 7373 6967 6e5f
3151060 7072 6976 6174 655f 5f33 696f 733a 2830 2c31 292c 3431 362c 3332 3b5f 5f76 7074 725f 5f33 696f 733a 2830 2c33 3029 3d2a
3151140 2830 2c31 3529 2c34 3438 2c33 323b 3b00 6261 7365 6669 656c 645f 5f33 696f 733a 4728 302c 3129 0061 646a 7573 7466 6965
3151220 6c64 5f5f 3369 6f73 3a47 2830 2c31 2900 666c 6f61 7466 6965 6c64 5f5f 3369 6f73 3a47 2830 2c31 2900 6e65 7874 6269 745f
3151300 5f33 696f 733a 4728 302c 3129 006e 6578 7477 6f72 645f 5f33 696f 733a 4728 302c 3129 0073 7464 696f 666c 7573 685f 5f33
3151360 696f 733a 4728 302c 3136 2900 696f 733a 5a63 696f 733b 3b5f 5f63 745f 5f33 696f 7346 5039 7374 7265 616d 6275 6620 5f5f
3151440 6374 5f5f 3369 6f73 4676 205f 5f63 745f 5f33 696f 7346 5233 696f 7320 5f5f 6474 5f5f 3369 6f73 4676 2066 6c61 6773 5f5f
3151520 3369 6f73 4676 2066 6c61 6773 5f5f 3369 6f73 466c 2073 6574 665f 5f33 696f 7346 6c54 3120 7365 7466 5f5f 3369 6f73 466c
3151600 2075 6e73 6574 665f 5f33 696f 7346 6c20 7769 6474 685f 5f33 696f 7346 7620 7769 6474 685f 5f33 696f 7346 6920 7469 655f
3151660 5f33 696f 7346 5037 6f73 7472 6561 6d20 5c00 7469 655f 5f33 696f 7346 7620 6669 6c6c 5f5f 3369 6f73 4663 2066 696c 6c5f
3151740 5f33 696f 7346 7620 7072 6563 6973 696f 6e5f 5f33 696f 7346 6920 7072 6563 6973 696f 6e5f 5f33 696f 7346 7620 7264 7374
3152020 6174 655f 5f33 696f 7346 7620 5f5f 6f70 5076 5f5f 3369 6f73 4676 205f 5f6e 745f 5f33 696f 7346 7620 656f 665f 5f33 696f
3152100 7346 7620 6661 696c 5f5f 3369 6f73 4676 2062 6164 5f5f 3369 6f73 4676 2067 6f6f 645f 5f33 696f 7346 7620 636c 6561 725f
3152160 5f33 696f 7346 6920 7264 6275 665f 5f33 696f 7346 7620 5c00 6977 6f72 645f 5f33 696f 7346 6920 7077 6f72 645f 5f33 696f
3152240 7346 6920 6269 7461 6c6c 6f63 5f5f 3369 6f73 5346 7620 7861 6c6c 6f63 5f5f 3369 6f73 5346 7620 7572 6573 697a 655f 5f33
3152320 696f 7346 6920 7379 6e63 5f77 6974 685f 7374 6469 6f5f 5f33 696f 7353 4676 2073 6574 7374 6174 655f 5f33 696f 7346 6920
3152400 696e 6974 5f5f 3369 6f73 4650 3973 7472 6561 6d62 7566 205f 5f61 735f 5f33 696f 7346 5233 696f 7320 736b 6970 5f5f 3369
3152460 6f73 4669 203b 6261 7365 6669 656c 645f 5f33 696f 7320 5c00 6164 6a75 7374 6669 656c 645f 5f33 696f 7320 666c 6f61 7466
3152540 6965 6c64 5f5f 3369 6f73 206e 6578 7462 6974 5f5f 3369 6f73 206e 6578 7477 6f72 645f 5f33 696f 7320 7374 6469 6f66 6c75
3152620 7368 5f5f 3369 6f73 203b 3b00 7374 7265 616d 6275 663a 5428 302c 3235 293d 7374 3061 6c6c 6f63 5f5f 3973 7472 6561 6d62
3152700 7566 3a28 302c 3429 2c30 2c31 363b 785f 756e 6275 665f 5f39 7374 7265 616d 6275 663a 2830 2c34 292c 3136 2c31 363b 785f
3152760 6261 7365 5f5f 3973 7472 6561 6d62 7566 3a28 302c 3331 293d 2a28 302c 3229 2c33 322c 3332 3b78 5f70 6261 7365 5f5f 3973
3153040 7472 6561 6d62 7566 3a28 302c 3331 292c 3634 2c33 323b 785f 7070 7472 5f5f 3973 7472 6561 6d62 7566 3a28 302c 3331 292c
3153120 3936 2c33 323b 785f 6570 7074 725f 5f39 7374 7265 616d 6275 663a 2830 2c33 3129 2c31 3238 2c33 323b 785f 6770 7472 5f5f
3153200 3973 7472 6561 6d62 7566 3a28 302c 3331 292c 3136 302c 3332 3b78 5f65 6770 7472 5f5f 3973 7472 6561 6d62 7566 3a28 302c
3153260 3331 292c 3139 322c 3332 3b5c 0078 5f65 6261 636b 5f5f 3973 7472 6561 6d62 7566 3a28 302c 3331 292c 3232 342c 3332 3b78
3153340 5f62 6c65 6e5f 5f39 7374 7265 616d 6275 6633 2830 2c31 292c 3235 362c 3332 3b5f 5f76 7074 725f 5f39 7374 7265 616d 6275
3153420 663a 2830 2c33 3029 2c32 3838 2c33 323b 3b00 7374 7265 616d 6275 663a 5a63 7374 7265 616d 6275 663b 3b5f 5f63 745f 5f39
3153500 7374 7265 616d 6275 6646 5239 7374 7265 616d 6275 6620 5f5f 6374 5f5f 3973 7472 6561 6d62 7566 4676 205f 5f63 745f 5f39
3153560 7374 7265 616d 6275 6646 5063 6920 5f5f 6374 5f5f 3973 7472 6561 6d62 7566 4650 6369 5432 205f 5f61 735f 5f39 7374 7265
3153640 616d 6275 6646 5239 7374 7265 616d 6275 6620 6462 705f 5f39 7374 7265 616d 6275 6646 7620 6261 7365 5f5f 3973 7472 6561
3153720 6d62 7566 4676 2070 6261 7365 5f5f 3973 7472 6561 6d62 7566 4676 205c 0070 7074 725f 5f39 7374 7265 616d 6275 6646 7620
3154000 6570 7074 725f 5f39 7374 7265 616d 6275 6646 7620 6770 7472 5f5f 3973 7472 6561 6d62 7566 4676 2065 6770 7472 5f5f 3973
3154060 7472 6561 6d62 7566 4676 2065 6261 636b 5f5f 3973 7472 6561 6d62 7566 4676 2065 6275 665f 5f39 7374 7265 616d 6275 6646
3154140 7620 626c 656e 5f5f 3973 7472 6561 6d62 7566 4676 2073 6574 705f 5f39 7374 7265 616d 6275 6646 5063 5431 2073 6574 675f
3154220 5f39 7374 7265 616d 6275 6646 5063 4e32 3120 7062 756d 705f 5f39 7374 7265 616d 6275 6646 6920 5c00 6762 756d 705f 5f39
3154300 7374 7265 616d 6275 6646 6920 7365 7462 5f5f 3973 7472 6561 6d62 7566 4650 6354 3169 2075 6e62 7566 6665 7265 645f 5f39
3154360 7374 7265 616d 6275 6646 7620 756e 6275 6666 6572 6564 5f5f 3973 7472 6561 6d62 7566 4669 2061 6c6c 6f63 6174 655f 5f39
3154440 7374 7265 616d 6275 6646 7620 646f 616c 6c6f 6361 7465 5f5f 3973 7472 6561 6d62 7566 4676 206f 7665 7266 6c6f 775f 5f39
3154520 7374 7265 616d 6275 6646 6920 756e 6465 7266 6c6f 775f 5f39 7374 7265 616d 6275 6646 7620 5c00 7062 6163 6b66 6169 6c5f
```

```
3154600  5f39 7374 7265 616d 6275 6646 6920 7379 6e63 5f5f 3973 7472 6561 6d62 7566 4676 2073 6565 6b6f 6666 5f5f 3973 7472 6561
3154660  6d62 7566 466c 3873 6565 6b5f 6469 7269 2073 6565 6b70 6f73 5f5f 3973 7472 6561 6d62 7566 466c 6920 7873 7075 746e 5f5f
3154740  3973 7472 6561 6d62 7566 4650 4363 6920 7873 6765 746e 5f5f 3973 7472 6561 6d62 7566 4650 6369 2069 6e5f 6176 6169 6c5f
3155020  5f39 7374 7265 616d 6275 6646 7620 6f75 745f 7761 6974 696e 675f 5f39 7374 7265 616d 6275 6646 7620 5c00 7367 6574 635f
3155100  5f39 7374 7265 616d 6275 6646 7620 736e 6578 7463 5f5f 3973 7472 6561 6d62 7566 4676 2073 6275 6d70 635f 5f39 7374 7265
3155160  616d 6275 6646 7620 7374 6f73 7363 5f5f 3973 7472 6561 6d62 7566 4676 2073 7075 7462 6163 6b63 5f5f 3973 7472 6561 6d62
3155240  7566 4663 2073 7075 7463 5f5f 3973 7472 6561 6d62 7566 4669 2073 7075 746e 5f5f 3973 7472 6561 6d62 7566 4650 4363 6920
3155320  7367 6574 6e5f 5f39 7374 7265 616d 6275 6646 5063 6920 7365 7462 7566 5f5f 3973 7472 6561 6d62 7566 4650 6369 205c 0073
3155400  6574 6275 665f 5f39 7374 7265 616d 6275 6646 5055 6369 2073 6574 6275 665f 5f39 7374 7265 616d 6275 6646 5063 6954 3220
3155460  5f5f 6474 5f5f 3973 7472 6561 6d62 7566 4676 2078 5f73 6e65 7874 635f 5f39 7374 7265 616d 6275 6646 7620 3b3b 3b00 6973
3155540  7472 6561 6d3a 5428 302c 3332 293d 7337 3278 5f67 636f 756e 745f 5f37 6973 7472 6561 6d3a 2830 2c31 292c 302c 3332 3b5f
3155620  5f76 7074 725f 5f37 6973 7472 6561 6d3a 2839 2c33 3029 2c33 322c 3332 3b50 696f 733a 2830 2c33 3329 3d2a 2830 2c32 3329
3155700  2c36 342c 3332 3b4f 696f 733a 2830 2c32 3329 2c39 362c 3438 303b 3b00 6973 7472 6561 6d3a 5a63 6973 7472 6561 6d3b 696f
3155760  733b 5f5f 6374 5f5f 3769 7374 7265 616d 4650 3973 7472 6561 6d62 7566 205f 5f63 745f 5f37 6973 7472 6561 6d46 7620 5f5f
3156040  6374 5f5f 3769 7374 7265 616d 4650 3973 7472 6561 6d62 7566 6950 376f 7374 7265 616d 205f 5f63 745f 5f37 6973 7472 6561
3156120  6d46 6950 6354 3120 5f5f 6374 5f5f 3769 7374 7265 616d 4669 5431 5037 6f73 7472 6561 6d20 5f5f 6374 5f5f 3769 7374 7265
3156200  616d 4652 3769 7374 7265 616d 205f 5f64 745f 5f37 6973 7472 6561 6d46 7620 5c00 6970 6678 5f5f 3769 7374 7265 616d 4669
3156260  2069 7366 785f 5f37 6973 7472 6561 6d46 7620 7365 656b 675f 5f37 6973 7472 6561 6d46 6c20 7365 656b 675f 5f37 6973 7472
3156340  6561 6d46 6c38 7365 656b 5f64 6972 2074 656c 6c67 5f5f 3769 7374 7265 616d 4676 205f 5f72 735f 5f37 6973 7472 6561 6d46
3156420  5046 5237 6973 7472 6561 6d5f 5237 6973 7472 6561 6d20 5f5f 7273 5f5f 3769 7374 7265 616d 4650 4652 3369 6f73 5f52 3369
3156500  6f73 205f 5f72 735f 5f37 6973 7472 6561 6d46 5063 205f 5f72 735f 5f37 6973 7472 6561 6d46 5055 6320 5c00 5f5f 7273 5f5f
3156560  3769 7374 7265 616d 4652 5563 205f 5f72 735f 5f37 6973 7472 6561 6d46 5263 205f 5f72 735f 5f37 6973 7472 6561 6d46 5273
3156640  205f 5f72 735f 5f37 6973 7472 6561 6d46 5269 205f 5f72 735f 5f37 6973 7472 6561 6d46 526c 205f 5f72 735f 5f37 6973 7472
3156720  6561 6d46 5255 7320 5f5f 7273 5f5f 3769 7374 7265 616d 4652 5569 205f 5f72 735f 5f37 6973 7472 6561 6d46 5255 6c20 5f5f
3157000  7273 5f5f 3769 7374 7265 616d 4652 6620 5f5f 7273 5f5f 3769 7374 7265 616d 4652 6420 5f5f 7273 5f5f 3769 7374 7265 616d
3157060  4650 3973 7472 6561 6d62 7566 205c 0067 6574 5f5f 3769 7374 7265 616d 4650 6369 6320 6765 745f 5f37 6973 7472 6561 6d46
3157140  5055 6369 6320 6765 745f 5f37 6973 7472 6561 6d46 5239 7374 7265 6161 6275 6663 2067 6574 5f5f 3769 7374 7265 616d 4652
3157220  5563 2067 6574 5f5f 3769 7374 7265 616d 4652 6320 6765 745f 5f37 6973 7472 6561 6d46 7620 6765 746c 696e 655f 5f37 6973
3157300  7472 6561 6d46 5063 6963 2067 6574 6c69 6e65 5f5f 3769 7374 7265 616d 4650 5563 6963 2070 6565 6b5f 5f37 6973 7472 6561
3157360  6d46 7620 6967 6e6f 7265 5f5f 3769 7374 7265 616d 4669 5431 205c 0072 6561 645f 5f37 6973 7472 6561 6d46 5063 6920 7265
3157440  6164 5f5f 3769 7374 7265 616d 4650 5563 6920 6763 6f75 6e74 5f5f 3769 7374 7265 616d 4676 2070 7574 6261 636b 5f5f 3769
3157520  7374 7265 616d 4663 2073 796e 635f 5f37 6973 7472 6561 6d46 7620 646f 5f69 7066 785f 5f37 6973 7472 6561 6d46 6920 6561
3157600  7477 6869 7465 5f5f 3769 7374 7265 616d 4676 2078 6765 745f 5f37 6973 7472 6561 6d46 5063 203b 3b3b 006f 7374 7265 616d
3157660  3a54 2830 2c32 3629 3d73 3638 5f5f 7670 7472 5f5f 376f 7374 7265 616d 3a28 302c 3330 292c 302c 3332 3b50 696f 733a 2830
3157740  2c33 3329 2c33 322c 3332 3b4f 696f 733a 2830 2c32 3329 2c36 342c 3438 303b 3b00 6f73 7472 6561 6d3a 5a63 6f73 7472 6561
3160020  6d3b 696f 733b 5f5f 6374 5f5f 376f 7374 7265 616d 4650 3973 7472 6561 6d62 7566 205f 5f63 745f 5f37 6f73 7472 6561 6d46
3160100  7620 5f5f 6374 5f5f 376f 7374 7265 616d 4669 205f 5f63 745f 5f37 6f73 7472 6561 6d46 6950 6320 5f5f 6374 5f5f 376f 7374
3160160  7265 616d 4652 376f 7374 7265 616d 205f 5f64 745f 5f37 6f73 7472 6561 6d46 7620 6f70 6678 5f5f 376f 7374 7265 616d 4676
3160240  206f 7366 785f 5f37 6f73 7472 6561 6d46 7620 666c 7573 685f 5f37 6f73 7472 6561 6d46 7620 5c00 7365 656b 705f 5f37 6f73
3160320  7472 6561 6d46 6c20 7365 656b 705f 5f37 6f73 7472 6561 6d46 6c38 7365 656b 5f64 6972 2074 656c 6c70 5f5f 376f 7374 7265
3160400  616d 4676 2070 7574 5f5f 376f 7374 7265 616d 4663 205f 5f6c 735f 5f37 6f73 7472 6561 6d46 6320 5f5f 6c73 5f5f 376f 7374
3160460  7265 616d 4655 6320 5f5f 6c73 5f5f 376f 7374 7265 616d 4650 4363 205f 5f6c 735f 5f37 6f73 7472 6561 6d46 6920 5f5f 6c73
3160540  5f5f 376f 7374 7265 616d 466c 205f 5f6c 735f 5f37 6f73 7472 6561 6d46 6420 5f5f 6c73 5f5f 376f 7374 7265 616d 4666 205c
3160620  005f 5f6c 735f 5f37 6f73 7472 6561 6d46 5569 205f 5f6c 735f 5f37 6f73 7472 6561 6d46 556c 205f 5f6c 735f 5f37 6f73 7472
3160700  6561 6d46 5076 205f 5f6c 735f 5f37 6f73 7472 6561 6d46 5039 7374 7265 616d 6275 6620 5f5f 6c73 5f5f 376f 7374 7265 616d
3160760  4673 205f 5f6c 735f 5f37 6f73 7472 6561 6d46 5573 205f 5f6c 735f 5f37 6f73 7472 6561 6d46 5046 5237 6f73 7472 6561 6d5f
3161040  5237 6f73 7472 6561 6d20 5f5f 6c73 5f5f 376f 7374 7265 616d 4650 4652 3369 6f73 5f52 3369 6f73 2077 7269 7465 5f5f 376f
3161120  7374 7265 616d 4650 4363 6920 5c00 7772 6974 655f 5f37 6f73 7472 6561 6d46 5043 5563 6920 646f 5f6f 7066 785f 5f37 6f73
3161200  7472 6561 6d46 7620 646f 5f6f 7366 785f 5f37 6f73 7472 6561 6d46 7620 3b3b 3b00 7075 745f 5f37 6f73 7472 6561 6d46 633a
3161260  6628 302c 3334 293d 2a28 302c 3236 2900 5f5f 3074 6869 733a 7028 302c 3334 2900 5f5f 3063 3a70 2830 2c32 2900 2f75 7372
3161340  2f43 432f 7375 6e34 2f69 6e63 6c2f 696f 7374 7265 616d 2e68 005f 5f30 7468 6973 3a72 2830 2c33 3429 005f 5f30 7468 6973
3161420  203a 5a74 6c00 5f5f 3063 203a 5a74 6c00 7075 745f 5f37 6f73 7472 6561 6d46 6320 3a5a 7446 0069 6f73 7472 6561 6d3a 5428
3161500  302c 3335 293d 7338 3078 5f67 636f 756e 745f 5f37 6973 7472 6561 6d3a 2830 2c31 292c 302c 3332 3b5f 5f76 7074 725f 5f37
3161560  6973 7472 6561 6d3a 2830 2c33 3029 2c33 322c 3332 3b50 696f 733a 2830 2c33 3329 2c36 342c 3332 3b4f 6f73 7472 6561 6d3a
3161640  2830 2c32 3629 2c39 362c 3534 343b 3b00 696f 7374 7265 616d 3a5a 6369 6f73 7472 6561 6d3b 6973 7472 6561 6d20 6f73 7472
```

```
3161720 6561 6d20 696f 733b 5f5f 6374 5f5f 3869 6f73 7472 6561 6d46 5039 7374 7265 616d 6275 6620 5f5f 6374 5f5f 3869 6f73 7472
3162000 6561 6d46 7620 5f5f 6374 5f5f 3869 6f73 7472 6561 6d46 5238 696f 7374 7265 616d 205f 5f64 745f 5f38 696f 7374 7265 616d
3162060 4676 203b 3b3b 0063 696e 3a47 2830 2c33 3629 3d78 7369 7374 7265 616d 5f77 6974 6861 7373 6967 6e3a 0063 6f75 743a 4728
3162140 302c 3337 293d 7873 6f73 7472 6561 6d5f 7769 7468 6173 7369 676e 3a00 6365 7272 3a47 2830 2c33 3729 0063 6c6f 673a 4728
3162220 302c 3337 2900 496f 7374 7265 616d 5f69 6e69 743a 5428 302c 3338 293d 7331 5f5f 5739 5f5f 3133 496f 7374 7265 616d 5f69
3162300 6e69 743a 2830 2c32 292c 302c 383b 3b00 7374 6473 7461 7475 735f 5f31 3349 6f73 7472 6561 6d5f 696e 6974 3a47 2830 2c31
3162360 2900 696e 6974 636f 756e 745f 5f31 3349 6f73 7472 6561 6d5f 696e 6974 3a47 2830 2c31 2900 496f 7374 7265 616d 5f69 6e69
3162440 743a 5a63 496f 7374 7265 616d 5f69 6e69 743b 3b5f 5f63 745f 5f31 3349 6f73 7472 6561 6d5f 696e 6974 4676 205f 5f64 745f
3162520 5f31 3349 6f73 7472 6561 6d5f 696e 6974 4676 203b 7374 6473 7461 7475 735f 5f31 3349 6f73 7472 6561 6d5f 696e 6974 2069
3162600 6e69 7463 6f75 6e74 5f5f 3133 496f 7374 7265 616d 5f69 6e69 7420 3b40 696f 733b 0069 6f73 7472 6561 6d5f 696e 6974 3a53
3162660 2830 2c33 3829 0047 5054 3a74 2830 2c31 3329 0073 6d61 6e69 705f 696e 743a 5428 302c 3339 293d 7338 6663 745f 5f31 3073
3162740 6d61 6e69 705f 696e 743a 2830 2c34 3029 3d2a 2830 2c34 3129 3d66 2830 2c33 3329 2c30 2c33 323b 6172 675f 5f31 3073 6d61
3163020 6e69 705f 696e 743a 2830 2c31 292c 3332 2c33 323b 3b00 736d 616e 6970 5f69 6e74 3a5a 6373 6d61 6e69 705f 696e 743b 3b5f
3163100 5f63 745f 5f31 3073 6d61 6e69 705f 696e 7446 5046 5233 696f 7369 5f52 3369 6f73 6920 3b3b 5f5f 6c73 5f5f 4652 376f 7374
3163160 7265 616d 5231 3073 6d61 6e69 705f 696e 7420 5f5f 7273 5f5f 4652 3769 7374 7265 616d 5231 3073 6d61 6e69 705f 696e 7420
3163240 3b00 7361 7070 6c79 5f69 6e74 3a54 2830 2c34 3229 3d73 3466 6374 5f5f 3130 7361 7070 6c79 5f69 6e74 3a28 302c 3430 292c
3163320 302c 3332 3b3b 0073 6170 706c 795f 696e 743a 5a63 7361 7070 6c79 5f69 6e74 3b3b 5f5f 6374 5f5f 3130 7361 7070 6c79 5f69
3163400 6e74 4650 4652 3369 6f73 695f 5233 696f 7320 5f5f 636c 5f5f 3130 7361 7070 6c79 5f69 6e74 4669 203b 3b3b 0069 6d61 6e69
3163460 705f 696e 743a 5429 302c 3433 293d 7338 6663 745f 5f31 3069 6d61 6e69 705f 696e 743a 2830 2c34 3429 3d2a 2830 2c34 3529
3163540 3d66 2830 2c34 3629 3d2a 2830 2c33 3229 2c30 2c33 323b 6172 675f 5f31 3069 6d61 6e69 705f 696e 743a 2830 2c31 292c 3332
3163620 2c33 323b 3b00 696d 616e 6970 5f69 6e74 3a5a 6369 6d61 6e69 705f 696e 743b 3b5f 5f63 745f 5f31 3069 6d61 6e69 705f 696e
3163700 7446 5046 5237 6973 7472 6561 6d69 5f52 3769 7374 7265 616d 6920 3b3b 5f5f 7273 5f5f 4652 3769 7374 7265 616d 5231 3069
3163760 6d61 6e69 705f 696e 7420 3b00 6961 7070 6c79 5f69 6e74 3a54 2830 2c34 3729 3d73 3466 6374 5f5f 3130 6961 7070 6c79 5f69
3164040 6e74 3a28 302c 3434 292c 302c 3332 3b3b 0069 6170 706c 795f 696e 743a 5a63 6961 7070 6c79 5f69 6e74 3b3b 5f5f 6374 5f5f
3164120 3130 6961 7070 6c79 5f69 6e74 4650 4652 3769 7374 7265 616d 695f 5237 6973 7472 6561 6d20 5f5f 636c 5f5f 3130 6961 7070
3164200 6c79 5f69 6e74 4669 203b 3b3b 006f 6d61 6e69 705f 696e 743a 5428 302c 3438 293d 7338 6663 745f 5f31 306f 6d61 6e69 705f
3164260 696e 743a 2830 2c34 3929 3d2a 2830 2c35 3029 3166 2830 2c33 3429 2c30 2c33 323b 6172 675f 5f31 306f 6d61 6e69 705f 696e
3164340 743a 2830 2c31 292c 3332 2c33 323b 3b00 6f6d 616e 6970 5f69 6e74 3a5a 636f 6d61 6e69 705f 696e 743b 3b5f 5f63 745f 5f31
3164420 306f 6d61 6e69 705f 696e 7446 5046 5237 6f73 7472 6561 6d69 5f52 376f 7374 7265 616d 6920 3b3b 5f5f 6c73 5f5f 4652 376f
3164500 7374 7265 616d 5231 306f 6d61 6e69 705f 696e 7420 3b00 6f61 7070 6c79 5f69 6e74 3a54 2830 2c35 3129 3d73 3466 6374 5f5f
3164560 3130 6f61 7070 6c79 5f69 6e74 3a28 302c 3439 292c 302c 3332 3b3b 006f 6170 706c 795f 696e 743a 5a63 6f61 7070 6c79 5f69
3164640 6e74 3b3b 5f5f 6374 5f5f 3130 6f61 7070 6c79 5f69 6e74 4650 4652 376f 7374 7265 616d 695f 5237 6f73 7472 6561 6d20 5f5f
3164720 636c 5f5f 3130 6f61 7070 6c79 5f69 6e74 4669 203b 3b3b 0069 6f6d 616e 6970 5f69 6e74 3a54 2830 2c35 3229 3d73 3866 6374
3165000 5f5f 3131 696f 6d61 6e69 705f 696e 743a 2830 2c35 3329 3d2a 2830 2c35 3429 3d66 2830 2c35 3529 3d2a 2830 2c33 3529 2c30
3165060 2c33 323b 6172 675f 5f31 3169 6f6d 616e 6970 5f69 6e74 3a28 302c 3129 2c33 322c 3332 3b3b 0069 6f6d 616e 6970 5f69 6e74
3165140 3a5a 6369 6f6d 616e 6970 5f69 6e74 3b3b 5f5f 6374 5f5f 3131 696f 6d61 6e69 705f 696e 7446 5046 5238 696f 7374 7265 616d
3165220 695f 5238 696f 7374 7265 616d 6920 3b3b 5f5f 6c73 5f5f 4652 3869 6f73 7472 6561 6d52 3131 696f 6d61 6e69 705f 696e 7420
3165300 5f5f 7273 5f5f 4652 3869 6f73 7472 6561 6d52 3131 696f 6d61 6e69 705f 696e 7420 3b00 696f 6170 706c 795f 696e 743a 5428
3165360 302c 3536 293d 7334 6663 745f 5f31 3169 6f61 7070 6c79 5f69 6e74 3a28 302c 3533 292c 302c 3332 3b3b 0069 6f61 7070 6c79
3165440 5f69 6e74 3a5a 6369 6f61 7070 6c79 5f69 6e74 3b3b 5f5f 6374 5f5f 3131 696f 6170 706c 795f 696e 7446 5046 5238 696f 7374
3165520 7265 616d 695f 5238 696f 7374 7265 616d 205f 5f63 6c5f 5f31 3169 6f61 7070 6c79 5f69 6e74 4669 203b 3b3b 0073 6d61 6e69
3165600 705f 6c6f 6e67 3a54 2830 2c35 3729 3d73 3866 6374 5f5f 3131 736d 616e 6970 5f6c 6f6e 673a 2830 2c34 3029 2c30 2c33 323b
3165660 6172 675f 5f31 3173 6d61 6e69 705f 6c6f 6e67 3a28 302c 3129 2c33 322c 3332 3b3b 0073 6d61 6e69 705f 6c6f 6e67 3a5a 6373
3165740 6d61 6e69 705f 6c6f 6e67 3b3b 5f5f 6374 5f5f 3131 736d 616e 6970 5f6c 6f6e 6746 5046 5233 696f 736c 5f52 3369 6f73 6c20
3166020 3b3b 5f5f 6c73 5f5f 4652 376f 7374 7265 616d 5231 3173 6d61 6e69 705f 6c6f 6e67 205f 5f72 735f 5f46 5237 6973 7472 6561
3166100 6d52 3131 736d 616e 6970 5f6c 6f6e 6720 3b00 7361 7070 6c79 5f6c 6f6e 673a 5428 302c 3538 293d 7334 6663 745f 5f31 3173
3166160 6170 706c 795f 6c6f 6e67 3a28 302c 3430 292c 302c 3332 3b3b 0073 6170 706c 795f 6c6f 6e67 3a5a 6373 6170 706c 795f 6c6f
3166240 6e67 3b3b 5f5f 6374 5f5f 3131 7361 7070 6c79 5f6c 6f6e 6746 5046 5233 696f 736c 5f52 3369 6f73 205f 5f63 6c5f 5f31 3173
3166320 6170 706c 795f 6c6f 6e67 466c 203b 3b3b 0069 6d61 6e69 705f 6c6f 6e67 3a54 2830 2c35 3929 3d73 3866 6374 5f5f 3131 696d
3166400 616e 6970 5f6c 6f6e 673a 2830 2c34 3429 2c30 2c33 323b 6172 675f 5f31 3169 6d61 6e69 705f 6c6f 6e67 3a28 302c 3129 2c33
3166460 322c 3332 3b3b 0069 6d61 6e69 705f 6c6f 6e67 3a5a 6369 6d61 6e69 705f 6c6f 6e67 3b3b 5f5f 6374 5f5f 3131 696d 616e 6970
3166540 5f6c 6f6e 6746 5046 5237 6973 7472 6561 6d6c 5f52 3769 7374 7265 616d 6c20 3b3b 5f5f 7273 5f5f 4652 3769 7374 7265 616d
3166620 5231 3169 6d61 6e69 705f 6c6f 6e67 203b 0069 6170 706c 795f 6c6f 6e67 3a54 2830 2c36 3029 3d73 3466 6374 5f5f 3131 6961
3166700 7070 6c79 5f6c 6f6e 673a 2830 2c34 3429 2c30 2c33 323b 3b00 6961 7070 6c79 5f6c 6f6e 673a 5a63 6961 7070 6c79 5f6c 6f6e
3166760 673b 3b5f 5f63 745f 5f31 3169 6170 706c 795f 6c6f 6e67 4650 4652 3769 7374 7265 616d 6c5f 5237 6973 7472 6561 6d20 5f5f
```

3167040 636c 5f5f 3131 6961 7070 6c79 5f6c 6f6e 6746 6c20 3b3b 3b00 6f6d 616e 6970 5f6c 6f6e 673a 5428 302c 3631 293d 7338 6663
3167120 745f 5f31 316f 6d61 6e69 705f 6c6f 6e67 3a28 302c 3439 292c 302c 3332 3b61 7267 5f5f 3131 6f6d 616e 6970 5f6c 6f6e 673a
3167200 2830 2c31 292c 3332 2c33 323b 3b00 6f6d 616e 6970 5f6c 6f6e 673a 5a63 6f6d 616e 6970 5f6c 6f6e 673b 3b5f 5f63 745f 5f31
3167260 316f 6d61 6e69 705f 6c6f 6e67 4650 4652 376f 7374 7265 616d 6c5f 5237 6f73 7472 6561 6d6c 203b 3b5f 5f6c 735f 5f46 5237
3167340 6f73 7472 6561 6352 3131 6f6d 616e 6970 5f6c 6f6e 6720 3b00 6f61 7070 6c79 5f6c 6f6e 673a 5428 302c 3632 293d 7334 6663
3167420 745f 5f31 316f 6170 706c 795f 6c6f 6e67 3a28 302c 3439 292c 302c 3332 3b3b 006f 6170 706c 795f 6c6f 6e67 3a5a 636f 6170
3167500 706c 795f 6c6f 6e67 3b3b 5f5f 6374 5f5f 3131 6f61 7070 6c79 5f6c 6f6e 6746 5046 5237 6f73 7472 6561 6d6c 5f52 376f 7374
3167560 7265 616d 205f 5f63 6c5f 5f31 316f 6170 706c 795f 6c6f 6e67 466c 203b 3b3b 0069 6f6d 616e 6970 5f6c 6f6e 673a 5428 302c
3167640 3633 293d 7338 6663 745f 5f31 3269 6f6d 616e 6970 5f6c 6f6e 673a 2830 2c35 3329 2c30 2c33 323b 6172 675f 5f31 3269 6f6d
3167720 616e 6970 5f6c 6f6e 673a 2830 2c31 292c 3332 2c33 323b 3b00 696f 6d61 6e69 705f 6c6f 6e67 3a5a 6369 6f6d 616e 6970 5f6c
3170000 6f6e 673b 3b5f 5f63 745f 5f31 3269 6f6d 616e 6970 5f6c 6f6e 6746 5046 5238 696f 7374 7265 616d 6c5f 5238 696f 7374 7265
3170060 616d 6c20 3b3b 5f5f 6c73 5f5f 4652 3869 6f73 7472 6561 6d52 3132 696f 6d61 6e69 705f 6c6f 6e67 205f 5f72 735f 5f46 5238
3170140 696f 7374 7265 616d 5231 3269 6f6d 616e 6970 5f6c 6f6e 6720 3b00 696f 6170 706c 795f 6c6f 6e67 3a54 2830 2c36 3429 3d73
3170220 3466 6374 5f5f 3132 696f 6170 706c 795f 6c6f 6e67 3a28 302c 3533 292c 302c 3332 3b3b 0069 6f61 7070 6c79 5f6c 6f6e 673a
3170300 5a63 696f 6170 706c 795f 6c6f 6e67 3b3b 5f5f 6374 5f5f 3132 696f 6170 706c 795f 6c6f 6e67 4650 4652 3869 6f73 7472 6561
3170360 6d6c 5f52 3869 6f73 7472 6561 6d20 5f5f 636c 5f5f 3132 696f 6170 706c 795f 6c6f 6e67 466c 203b 3b3b 0065 7272 6e6f 3a47
3170440 2830 2c31 2900 7379 735f 6e65 7272 3a47 2830 2c31 2900 7374 6469 6f62 7566 3a54 2830 2c36 3629 3d73 3532 616c 6c6f 635f
3170520 5f39 7374 7265 616d 6275 663a 2830 2c34 292c 302c 3136 3b78 5f75 6e62 7566 5f5f 3973 7472 6561 6d62 7566 3a28 302c 3429
3170600 2c31 362c 3136 3b78 5f62 6173 655f 5f39 7374 7265 616d 6275 663a 2830 2c33 3129 2c33 322c 3332 3b78 5f70 6261 7365 5f5f
3170660 3973 7472 6561 6462 7566 3a28 302c 3331 292c 3634 2c33 323b 785f 7070 7472 5f5f 3973 7472 6561 6d62 7566 3a28 302c 3331
3170740 292c 3936 2c33 323b 785f 6570 7074 725f 5f39 7374 7265 616d 6275 663a 2830 2c33 3129 2c31 3238 2c33 323b 785f 6770 7472
3171020 5f5f 3973 7472 6561 6d62 7566 3a28 302c 3331 292c 3136 302c 3332 3b78 5f65 6770 7472 5f5f 3973 7472 6561 6d62 7566 3a28
3171100 302c 3331 292c 3139 322c 3332 3b5c 0078 5f65 6261 636b 5f5f 3973 7472 6561 6d62 7566 3a28 302c 3331 292c 3232 342c 3332
3171160 3b78 5f62 6c65 6e5f 5f39 7374 7265 616d 6275 663a 2830 2c31 292c 3235 362c 3332 3b5f 5f76 7074 725f 5f39 7374 7265 616d
3171240 6275 663a 2830 2c33 3029 2c32 3838 2c33 323b 6670 5f5f 3873 7464 696f 6275 663a 2830 2c36 3729 3d2a 2830 2c36 3529 3d78
3171320 735f 696f 6275 663a 2c33 3230 2c33 323b 6c61 7374 5f6f 705f 5f38 7374 6469 6f62 7566 3a28 302c 3129 2c33 3532 2c33 323b
3171400 6275 665f 5f38 7374 6469 6f62 7566 3a28 302c 3538 293d 6172 2830 2c31 293b 303b 313b 2830 2c32 292c 3338 342c 3136 3b3b
3171460 0073 7464 696f 6275 663a 5a63 7374 6469 6f62 7566 3b73 7472 6561 6d62 7566 3b6f 7665 7266 6c6f 775f 5f38 7374 6469 6f62
3171540 7566 4669 2075 6e64 6572 666c 6f77 5f5f 3873 7464 696f 6275 6646 7620 7379 6e63 5f5f 3873 7464 696f 6275 6646 7620 7365
3171620 656b 6f66 665f 5f38 7374 6469 6f62 7566 466c 3873 6565 6b5f 6469 7269 2070 6261 636b 6661 696c 5f5f 3873 7464 696f 6275
3171700 6646 6920 5f5f 6374 5f5f 3873 7464 696f 6275 6646 5036 5f69 6f62 7566 205f 5f63 745f 5f38 7374 6469 6f62 7566 4652 4338
3171760 7374 6469 6f62 7566 205c 0073 7464 696f 6669 6c65 5f5f 3873 7464 696f 6275 6646 7620 5f5f 6474 5f5f 3873 7464 696f 6275
317204C 6646 7620 3b3b 3b00 6669 6c65 6275 663a 5428 302c 3639 293d 7336 3461 6c6c 6f63 5f5f 3973 7472 6561 6d62 7566 3a28 302c
3172120 3429 2c30 2c31 363b 785f 756e 6275 665f 5f39 7374 7265 616d 6275 663a 2830 2c34 292c 3136 2c31 363b 785f 6261 7365 5f5f
3172200 3973 7472 6561 6d62 7566 3a28 302c 3331 292c 3332 2c33 323b 785f 7062 6173 655f 5f39 7374 7265 616d 6275 663a 2830 2c33
3172260 3129 2c36 342c 3332 3b78 5f70 7074 725f 5f39 7374 7265 616d 6275 663a 2830 2c33 3129 2c39 362c 3332 3b78 5f65 7070 7472
3172340 5f5f 3973 7472 6561 6d62 7566 3a28 302c 3331 292c 3132 382c 3332 3b78 5f67 7074 725f 5f39 7374 7265 616d 6275 663a 2830
3172420 2c33 3129 2c31 3630 2c33 323b 785f 6567 7074 725f 5f39 7374 7265 616d 6275 663a 2830 2c33 3129 2c31 3932 2c33 323b 5c00
3172500 785f 6562 6163 6b5f 5f39 7374 7265 616d 6275 663a 2830 2c33 3129 2c32 3234 2c33 323b 785f 626c 656e 5f5f 3973 7472 6561
3172560 6d62 7566 3a28 302c 3129 2c32 3536 2c33 323b 5f5f 7670 7472 5f5f 3973 7472 6561 6d62 7566 3a28 302c 3330 292c 3238 382c
3172640 3332 3b78 6664 5f5f 3766 696c 6562 7566 3a28 302c 3129 2c33 3230 2c33 323b 6d6f 6465 5f5f 3766 696c 6562 7566 3a28 302c
3172720 3129 2c33 3532 2c33 323b 6f70 656e 6564 5f5f 3766 696c 6562 7566 3a28 302c 3229 2c33 3834 2c38 3b6c 6173 745f 7365 656b
3173000 5f5f 3766 696c 6562 7566 3a28 302c 3129 2c34 3136 2c33 323b 696e 5f73 7461 7274 5f5f 3766 696c 6562 7566 3a28 302c 3331
3173060 292c 3434 382c 3332 3b6c 6168 6561 645f 5f37 6669 6c65 6275 663a 2830 2c36 3829 2c34 3830 2c31 363b 3b00 6f70 656e 7072
3173140 6f74 5f5f 3766 696c 6562 7566 3a47 2830 2c31 2900 6669 6c65 6275 663a 5a63 6669 6c65 6275 663b 7374 7265 616d 6275 663b
3173220 5f5f 6374 5f5f 3766 696c 6562 7566 4676 205f 5f63 745f 5f37 6669 6c65 6275 6646 6920 5f5f 6374 5f5f 3766 696c 6562 7566
3173300 4669 5063 5431 205f 5f63 745f 5f37 6669 6c65 6275 6646 5243 3766 696c 6562 7566 2069 735f 6f70 656e 5f5f 3766 696c 6562
3173360 7566 4676 2066 645f 5f37 6669 6c65 6275 6646 7620 6f70 656e 5f5f 3766 696c 6562 7566 4650 4363 6954 3220 6174 7461 6368
3173440 5f5f 3766 696c 6562 7566 4669 2063 6c6f 7365 5f5f 3766 696c 6562 7566 4676 205c 005f 5f64 745f 5f37 6669 6c65 6275 6646
3173520 7620 6f76 6572 666c 6f77 5f5f 3766 696c 6562 7566 4669 2075 6e64 6572 666c 6f77 5f5f 3766 696c 6562 7566 4676 2073 796e
3173600 635f 5f37 6669 6c65 6275 6646 7620 7365 656b 6f66 665f 5f37 6669 6c65 6275 6646 6c38 7365 656b 5f64 6972 6920 7365 7462
3173660 7566 5f5f 3766 696c 6562 7566 4650 6369 206c 6173 745f 6f70 5f5f 3766 696c 6562 7566 4676 203b 6f70 656e 7072 6f74 5f5f
3173740 3766 696c 6562 7566 203b 3b00 6673 7472 6561 6d62 6173 653a 5428 302c 3730 293d 7331 3332 6275 665f 5f31 3166 7374 7265
3174020 616d 6261 7365 3a28 302c 3639 292c 302c 3531 323b 5f5f 7670 7472 5f5f 3131 6673 7472 6561 6d62 6173 653a 2830 2c33 3029
3174100 2c35 3132 2c33 323b 5069 6f73 3a28 302c 3333 292c 3534 342c 3332 3b4f 696f 733a 2830 2c32 3329 2c35 3736 2c34 3830 3b3b

```
3174160  0066 7374 7265 616d 6261 7365 3a5a 6366 7374 7265 616d 6261 7365 3b69 6f73 3b5f 5f63 745f 5f31 3166 7374 7265 616d 6261
3174240  7365 4676 205f 5f63 745f 5f31 3166 7374 7265 616d 6261 7365 4650 4363 6954 3220 5f5f 6374 5f5f 3131 6673 7472 6561 6d62
3174320  6173 6546 6920 5f5f 6374 5f5f 3131 6673 7472 6561 6d62 6173 6546 6953 6354 3120 5f5f 6374 5f5f 3131 6673 7472 6561 6d62
3174400  6173 6546 5231 3166 7374 7265 616d 6261 7365 205f 5f64 745f 5f31 3166 7374 7265 616d 6261 7365 4676 206f 7065 6e5f 5f31
3174460  3166 7374 7265 616d 6261 7365 4650 4363 6954 3220 5c00 6174 7461 6368 5f5f 3131 6673 7472 6561 6d62 6173 6546 6920 636c
3174540  6f73 655f 5f31 3166 7374 7265 616d 6261 7365 4676 2073 6574 6275 665f 5f31 3166 7374 7265 616d 6261 7365 4650 6369 2072
3174620  6462 7566 5f5f 3131 6673 7472 6561 6d62 6173 6546 7620 7665 7269 6679 5f5f 3131 6673 7472 6561 6d62 6173 6546 6920 3b3b
3174700  3b00 7374 6174 655f 7661 6c75 653a 7428 302c 3138 2900 4f62 6a65 6374 3a54 2830 2c37 3129 3d73 345f 5f76 7074 725f 5f36
3174760  4f62 6a65 6374 3a28 302c 3330 292c 302c 3332 3b3b 004f 626a 6563 743a 5a63 4f62 6a65 6374 3b3b 5f5f 6374 5f5f 364f 626a
3175040  6563 7446 7620 5f5f 6374 5f5f 364f 626a 6563 7446 5243 364f 626a 6563 7420 6572 726f 724d 656d 6f72 795f 5f36 4f62 6a65
3175120  6374 4650 6354 3120 6578 706c 6169 6e5f 5f36 4f62 6a65 6374 4650 6320 696e 4f72 6465 725f 5f36 4f62 6a65 6374 4650 364f
3175200  626a 6563 7420 3b3b 3b00 5f5f 7074 626c 5f5f 364f 626a 6563 745f 5f50 4c69 7374 5f64 625f 6378 783a 4728 302c 3330 2900
3175260  5046 3a74 2830 2c31 3529 0050 4643 3a74 2830 2c31 3529 0050 4649 3a74 2830 2c31 3529 004e 4f62 6a65 6374 3a54 2830 2c37
3175340  3229 3d73 385f 5f76 7074 725f 5f36 4f62 6a65 6374 3a28 302c 3330 292c 302c 3332 3b6e 616d 655f 5f37 4e4f 626a 6563 743a
3175420  2830 2c33 3129 2c33 322c 3332 3b3b 004e 4f62 6a65 6374 3a5a 634e 4f62 6a65 6374 3b4f 626a 6563 743b 5f5f 6374 5f5f 374e
3175500  4f62 6a65 6374 4650 6320 5f5f 6374 5f5f 374e 4f62 6a65 6374 4652 4337 4e4f 626a 6563 7420 7365 744e 616d 655f 5f37 4e4f
3175560  626a 6563 7446 5063 2067 6574 4e61 6d65 5f5f 374e 4f62 6a65 6374 4676 2065 7870 6c61 696e 5f5f 374e 4f62 6a65 6374 4650
3175640  6320 6765 7441 7474 725f 5f37 4e4f 626a 6563 7446 6920 6765 7450 726f 705f 5f37 4e4f 626a 6563 7446 5063 6920 7365 7450
3175720  726f 705f 5f37 4e4f 626a 6563 7446 5063 5431 205c 0073 6574 5072 6f70 5f5f 374e 4f62 6a65 6374 4650 6369 2073 6574 5072
3176000  6f70 5f5f 374e 4f62 6a65 6374 4650 6366 2069 7347 5445 5f5f 374e 4f62 6a65 6374 4650 364f 626a 6563 7420 6973 4c54 455f
3176060  5f37 4e4f 626a 6563 7446 5036 4f62 6a65 6374 203b 3b3b 006f 7374 7265 616d 5f77 6974 6861 7373 6967 6e3a 5428 302c 3337
3176140  293d 7336 385f 5f76 7074 725f 5f37 6f73 7472 6561 6d3a 2830 2c33 3029 2c30 2c33 323b 5069 6f73 3a28 302c 3333 292c 3332
3176220  2c33 323b 4f69 6f73 3a28 302c 3233 292c 3634 2c34 3830 3b3b 006f 7374 7265 616d 5f77 6974 6861 7373 6967 6e3a 5a63 6f73
3176300  7472 6561 6d5f 7769 7468 6173 7369 676e 3b6f 7374 7265 616d 2069 6f73 3b5f 5f63 745f 5f31 386f 7374 7265 616d 5f77 6974
3176360  6861 7373 6967 6e46 7620 5f5f 6374 5f5f 3138 6f73 7472 6561 6d5f 7769 7468 6173 7369 676e 4652 3138 6f73 7472 6561 6d5f
3176440  7769 7468 6173 7369 676e 205f 5f64 745f 5f31 386f 7374 7265 616d 5f77 6974 6861 7373 6967 6e46 7620 5f5f 6173 5f5f 3138
3176520  6f73 7472 6561 6d5f 7769 7468 6173 7369 676e 4652 376f 7374 7265 616d 205c 005f 5f61 735f 5f31 386f 7374 7265 616d 5f77
3176600  6974 6861 7373 6967 6e46 5039 7374 7265 616d 6275 6620 3b3b 3b00 5046 423a 7428 302c 3135 2900 4c4e 4f62 6a65 6374 3a54
3176660  2830 2c37 3329 3d73 3132 5f5f 7670 7472 5f5f 364f 626a 6563 743a 2830 2c33 3029 2c30 2c33 323b 6e61 6d65 5f5f 374e 4f62
3176740  6a65 6374 3a28 302c 3331 292c 3332 2c33 323b 6e65 7874 5f5f 384c 4e4f 626a 6563 743a 2830 2c37 3429 3d2a 2830 2c37 3329
3177020  2c36 342c 3332 3b3b 004c 4e4f 626a 6563 743a 5a63 4c4e 4f62 6a65 6374 3b4e 4f62 6a65 6374 3b5f 5f63 745f 5f38 4c4e 4f62
3177100  6a65 6374 4650 6350 384c 4e4f 626a 6563 7420 5f5f 6374 5f5f 384c 4e4f 626a 6563 7446 5243 384c 4e4f 626a 6563 7420 7365
3177160  744e 6578 745f 5f38 4c4e 4f62 6a65 6374 4650 384c 4e4f 626a 6563 7420 6765 744e 6578 745f 5f38 4c4e 4f62 6a65 6374 4676
3177240  203b 3b3b 004c 4f62 6a65 6374 3a54 2830 2c37 3529 3d73 385f 5f76 7074 725f 5f36 4f62 6a65 6374 3a28 302c 3330 292c 302c
3177320  3332 3b6e 6578 745f 5f37 4c4f 626a 6563 743a 2830 2c37 3629 3d2a 2830 2c37 3529 2c33 322c 3332 3b3b 004c 4f62 6a65 6374
3177400  3a5a 634c 4f62 6a65 6374 3b4f 626a 6563 743b 5f5f 6374 5f5f 374c 4f62 6a65 6374 4650 374c 4f62 6a65 6374 205f 5f63 745f
3177460  5f37 4c4f 626a 6563 7446 5243 374c 4f62 6a65 6374 2073 6574 4e65 7874 5f5f 374c 4f62 6a65 6374 4650 374c 4f62 6a65 6374
3177540  2067 6574 4e65 7874 5f5f 374c 4f62 6a65 6374 4676 203b 3b3b 004c 504f 626a 6563 743a 5428 302c 3737 293d 7331 325f 5f76
3177620  7074 725f 5f36 4f62 6a65 6374 3a28 302c 3330 292c 302c 3332 3b6e 6578 745f 5f37 4c4f 626a 6563 743a 2830 2c37 3629 2c33
3177700  322c 3332 3b6e 6f62 6a70 7472 5f5f 384c 504f 626a 6563 743a 2830 2c37 3829 3d2a 2830 2c37 3229 2c36 342c 3332 3b3b 004c
3177760  504f 626a 6563 743a 5a63 4c50 4f62 6a65 6374 3b4c 4f62 6a65 6374 3b5f 5f63 745f 5f38 4c50 4f62 6a65 6374 4650 374e 4f62
3200040  6a65 6374 5037 4c4f 626a 6563 7420 5f5f 6374 5f5f 384c 504f 626a 6563 7446 5243 384c 504f 626a 6563 7420 7365 744f 626a
3200120  6563 745f 5f38 4c50 4f62 6a65 6374 4650 374e 4f62 6a65 6374 2067 6574 4f62 6a65 6374 5f5f 384c 504f 626a 6563 7446 7620
3200200  6578 706c 6169 6e5f 5f38 4c50 4f62 6a65 6374 4650 6320 3b3b 3b00 5f5f 7074 626c 5f5f 384c 504f 626a 6563 745f 5f50 4c69
3200260  7374 5f64 625f 6378 783a 4728 302c 3330 2900 4c69 7374 3a54 2830 2c37 3929 3d73 3132 636f 756e 745f 5f34 4c69 7374 3a28
3200340  302c 3129 2c30 2c33 323b 7074 724c 4f62 6a65 6374 5f5f 344c 6973 743a 2830 2c37 3629 2c33 322c 3332 3b5f 5f76 7074 725f
3200420  5f34 4c69 7374 3a28 302c 3330 292c 3634 2c33 323b 3b00 4c69 7374 3a5a 634c 6973 743b 3b5f 5f63 745f 5f34 4c69 7374 4676
3200500  205f 5f63 745f 5f34 4c69 7374 4652 4334 4c69 7374 205f 5f64 745f 5f34 4c69 7374 4676 2067 6574 436f 756e 745f 5f34 4c69
3200560  7374 4676 2067 6574 546f 705f 5f34 4c69 7374 4676 2073 6574 546f 705f 5f34 4c69 7374 4650 374c 4f62 6a65 6374 2065 7272
3200640  6f72 4d65 6d6f 7279 5f5f 344c 6973 7446 5063 5431 2062 726f 6164 6361 7374 5f5f 344c 6973 7446 4d36 4f62 6a65 6374 4676
3200720  5f76 2065 7870 6c61 696e 5f5f 344c 6973 7446 5063 205c 0069 6e73 6572 745f 5f34 4c69 7374 4650 374c 4f62 6a65 6374 2069
3201000  734d 656d 6265 725f 5f34 4c69 7374 4650 374c 4f62 6a65 6374 2069 734d 656d 6265 725f 5f34 4c69 7374 4650 6320 6973 4571
3201060  7561 6c5f 5f34 4c69 7374 4652 344c 6973 7420 7265 6d6f 7665 5f5f 344c 6973 7446 5063 203b 3b3b 005f 5f70 7462 6c5f 5f34
3201140  4c69 7374 5f5f 504c 6973 745f 6462 5f63 7878 3a47 2830 2c33 3029 0050 4c69 7374 3a54 2830 2c38 3029 3d73 3132 636f 756e
3201220  745f 5f34 4c69 7374 3a28 302c 3129 2c30 2c33 323b 7074 724c 4f62 6a65 6374 5f5f 344c 6973 743a 2830 2c37 3629 2c33 322c
```

3201300 3332 3b5f 5f76 7074 725f 5f34 4c69 7374 3a28 302c 3330 292c 3634 2c33 323b 3b00 504c 6973 743a 5a63 504c 6973 743b 4c69
3201360 7374 3b69 6e73 6572 745f 5f35 504c 6973 7446 5038 4c50 4f62 6a65 6374 2069 6e73 6572 745f 5f35 504c 6973 7446 5235 504c
3201440 6973 7420 536f 7274 5f50 4c69 7374 5f5f 3550 4c69 7374 4669 2072 6576 6572 7365 5f5f 3550 4c69 7374 4676 2069 6e73 6572
3201520 7441 6674 6572 5f5f 3550 4c69 7374 4650 384c 504f 626a 6563 7454 3120 7265 6d6f 7665 5f5f 3550 4c69 7374 4650 384c 504f
3201600 626a 6563 7420 7265 6d6f 7665 5f5f 3550 4c69 7374 4650 6320 6973 4d65 6d62 6572 5f5f 3550 4c69 7374 4650 6320 5c00 6973
3201660 4d65 6d62 6572 5f5f 3550 4c69 7374 4650 374c 4f62 6a65 6374 2069 7345 7175 616c 5f5f 3550 4c69 7374 4652 344c 6973 7420
3201740 6578 706c 6169 6e5f 5f35 504c 6973 7446 5063 205f 5f63 745f 5f35 504c 6973 7446 5243 3550 4c69 7374 205f 5f63 745f 5f35
3202020 504c 6973 7446 7620 3b3b 3b00 5f5f 7074 626c 5f5f 3550 4c69 7374 5f5f 504c 6973 745f 6462 5f63 7878 3a47 2830 2c33 3029
3202100 0069 6e73 6572 745f 5f35 504c 6973 7446 5038 4c50 4f62 6a65 6374 3a46 2830 2c37 3829 005f 5f30 7468 6973 3a70 2830 2c38
3202160 3129 3d2a 2830 2c38 3029 005f 5f30 6c70 6f62 6a3a 7028 302c 3832 293d 2a28 302c 3737 2900 504c 6973 745f 6462 2e63 7878
3202240 005f 5f30 7468 6973 203a 5a74 6c00 5f5f 306c 706f 626a 203a 5a74 6c00 696e 7365 7274 5f5f 3550 4c69 7374 4650 384c 504f
3202320 626a 6563 7420 3a5a 7446 0069 6e73 6572 745f 5f35 504c 6973 7446 5235 504c 6973 743a 4628 302c 3229 005f 5f30 7468 6973
3202400 3a70 2830 2c38 3129 005f 5f30 6c3a 7028 302c 3831 2900 5f5f 3074 6869 733a 7228 302c 3831 2900 5f5f 3174 3a28 302c 3832
3202460 2900 5f5f 316f 623a 2830 2c38 3229 005f 5f30 5f5f 5874 6869 7330 3071 306f 7864 693a 2830 2c38 3229 005f 5f30 5f5f 586e
3202540 3030 7130 6f78 6469 3a28 302c 3738 2900 5f5f 305f 5f58 7468 6973 3030 797a 6478 6770 3a28 302c 3736 2900 5f5f 305f 5f58
3202620 6f30 3079 7a6d 7867 703a 2830 2c37 3629 005f 5f30 7468 6973 203a 5a74 6c00 5f5f 306c 203a 5a74 6c00 5f5f 306c 203a 5a72
3202700 005f 5f31 7420 3a5a 746c 005f 5f31 6f62 203a 5a74 6c00 5f5f 305f 5f58 7468 6973 3030 7130 6f78 6469 203a 5a74 6c00 5f5f
3202760 305f 5f58 6e30 3071 306f 7864 6920 3a5a 746c 005f 5f30 5f5f 5874 6869 7330 3079 7a6d 7867 7020 3a5a 746c 005f 5f30 5f5f
3203040 586f 3030 797a 6478 6770 203a 5a74 6c00 696e 7365 7274 5f5f 3550 4c69 7374 4652 3550 4c69 7374 203a 5a74 4600 7265 6d6f
3203120 7665 5f5f 3550 4c69 7374 4650 384c 504f 626a 6563 743a 4628 302c 3129 005f 5f30 7468 6973 3a70 2830 2c38 3129 005f 5f30
3203200 696e 4f62 6a3a 7028 302c 3832 2900 5f5f 3074 6869 733a 7228 302c 3831 2900 5f5f 3169 6e4e 4f62 6a3a 2830 2c37 3829 005f
3203260 5f31 746d 703a 2830 2c38 3229 005f 5f31 7461 704e 4f62 6a3a 2830 2c37 3829 005f 5f31 6375 7272 3a28 302c 3832 2900 5f5f
3203340 305f 5f58 7430 3071 6374 7864 6b3a 2830 2c37 3629 005f 5f30 5f5f 5874 6869 7330 3071 346d 7864 6b3a 2830 2c37 3629 005f
3203420 5f30 5f5f 586f 3030 7134 6d78 646b 3a28 302c 3736 2900 5f5f 3074 6869 7320 3a5a 746c 005f 5f30 696e 4f62 6a20 3a5a 746c
3203500 005f 5f31 696e 4e4f 626a 203a 5a74 6c00 5f5f 3174 6d70 203a 5a74 6c00 5f5f 3174 6d70 4e4f 626a 203a 5a74 6c00 5f5f 3163
3203560 7572 7220 3a5a 746c 005f 5f30 5f5f 5874 3030 7163 7478 646b 203a 5a74 6c00 5f5f 305f 5f58 7468 6973 3030 7134 6d78 646b
3203640 203a 5a74 6c00 5f5f 305f 5f58 6f30 3071 346d 7864 6b20 3a5a 746c 0072 656d 6f76 655f 5f35 504c 6973 7446 5038 4c50 4f62
3203720 6a65 6374 203a 5a74 4600 7265 6d6f 7665 5f5f 3550 4c69 7374 4650 633a 4628 302c 3129 005f 5f30 7468 6973 3a70 2830 2c38
3204000 3129 005f 5f30 733a 7028 302c 3331 2900 5f5f 3374 6869 733a 7228 302c 3831 2900 5f5f 3163 7572 723a 2830 2c37 3629 005f
3204060 5f31 746d 704e 4f62 6a3a 2830 2c37 3829 005f 5f31 6375 7272 4e4f 626a 3a28 302c 3738 2900 5f5f 3174 6d70 3a28 302c 3736
3204140 2900 5f5f 305f 5f58 7430 3071 6374 7866 703a 2830 2c37 3629 005f 5f30 5f5f 5874 6869 7330 3071 346d 7866 703a 2830 2c37
3204220 3629 005f 5f30 5f5f 586f 3030 7134 6d78 6670 3a28 302c 3736 2900 5f5f 3074 6869 7320 3a5a 746c 005f 5f30 7320 3a5a 746c
3204300 005f 5f31 6375 7272 203a 5a74 6c00 5f5f 3174 6d70 4e4f 626a 203a 5a74 6c00 5f5f 3163 7572 724e 4f62 6a20 3a5a 746c 005f
3204360 5f31 746d 7020 3a5a 746c 005f 5f30 5f5f 5874 3030 7163 7478 6670 203a 5a74 6c00 5f5f 305f 5f58 7468 6973 3030 7134 6d78
3204440 6670 203a 5a74 6c00 5f5f 305f 5f58 6f30 3071 346d 7866 7020 3a5a 746c 0072 656d 6f76 655f 5f35 504c 6973 7446 5063 203a
3204520 5a74 4600 696e 7365 7274 4166 7465 725f 5f35 504c 6973 7446 5038 4c50 4f62 6a65 6374 5431 3a46 2830 2c32 2900 5f5f 3074
3204600 6869 733a 7028 302c 3831 2900 5f5f 3061 5074 723a 7028 302c 3832 2900 5f5f 304e 6577 5074 723a 7028 302c 3832 2900 5f5f
3204660 3074 6869 733a 7228 302c 3831 2900 5f5f 3163 7572 723a 2830 2c37 3629 005f 5f31 5374 6f70 3a28 302c 3129 005f 5f30 5f5f
3204740 5874 6869 7330 3071 346d 7864 6b3a 2830 2c37 3629 005f 5f30 5f5f 586f 3030 7134 6d78 646b 3a28 302c 3736 2900 5f5f 3074
3205020 6869 7320 3a5a 746c 005f 5f30 6150 7472 203a 5a74 6c00 5f5f 304e 6577 5074 7220 3a5a 746c 005f 5f31 6375 7272 203a 5a74
3205100 6c00 5f5f 3153 746f 7020 3a5a 746c 005f 5f30 5f5f 5874 6869 7330 3071 346d 7864 6b20 3a5a 746c 005f 5f30 5f5f 586f 3030
3205160 7134 6d78 646b 203a 5a74 6c00 696e 7365 7274 4166 7465 725f 5f35 504c 6973 7446 5038 4c50 4f62 6a65 6374 5431 203a 5a74
3205240 4600 6973 4d65 6d62 6572 5f5f 3550 4c69 7374 4650 374c 4f62 6a65 6374 3a46 2830 2c37 3629 005f 5f30 7468 6973 3a70 2830
3205320 2c38 3129 005f 5f30 6e3a 7028 302c 3736 2900 5f5f 3074 6869 733a 7228 302c 3831 2900 5f5f 3163 7572 723a 2830 2c38 3229
3205400 005f 5f31 6e4e 4f62 6a3a 2830 2c37 3829 005f 5f30 5f5f 5874 6869 7330 3079 7632 776c 613a 2830 2c37 3829 005f 5f30 7468
3205460 6973 203a 5a74 6c00 5f5f 306e 203a 5a74 6c00 5f5f 3163 7572 7220 3a5a 746c 005f 5f31 6e4e 4f62 6a20 3a5a 746c 005f 5f30
3205540 5f5f 5874 6869 7330 3079 7632 776c 6120 3a5a 746c 0069 734d 656d 6265 725f 5f35 504c 6973 7446 5037 4c4f 626a 6563 7420
3205620 3a5a 7446 0069 734d 656d 6265 725f 5f35 504c 6973 7446 5063 3a46 2830 2c37 3829 005f 5f30 7468 6973 3a70 2830 2c38 3129
3205700 005f 5f30 6e61 6d65 3a70 2830 2c33 3129 005f 5f30 7468 6973 3a72 2830 2c38 3129 005f 5f31 6375 7272 3a28 302c 3832 2900
3205760 5f5f 305f 5f58 7468 6973 3030 7976 3277 7064 3a28 302c 3738 2900 5f5f 3074 6869 7320 3a5a 746c 005f 5f30 6e61 6d65 203a
3206040 5a74 6c00 5f5f 3163 7572 7220 3a5a 746c 005f 5f30 5f5f 5874 6869 7330 3079 7632 7770 6420 3a5a 746c 0069 734d 656d 6265
3206120 725f 5f35 504c 6973 7446 5063 203a 5a74 4600 6973 4571 7561 6c5f 5f35 504c 6973 7446 5234 4c69 7374 3a46 2830 2c31 2900
3206200 5f5f 3074 6869 733a 7028 302c 3831 2900 5f5f 306c 3a70 2830 2c38 3329 3d2a 2830 2c37 3929 005f 5f30 7468 6973 3a72 2830
3206260 2c38 3129 005f 5f31 783a 2830 2c37 3629 005f 5f30 7468 6973 203a 5a74 6c00 5f5f 306c 203a 5a74 6c00 5f5f 306c 203a 5a72
3206340 005f 5f31 7820 3a5a 746c 0069 7345 7175 616c 5f5f 3550 4c69 7374 4652 344c 6973 7420 3a5a 7446 0065 7870 6c61 696e 5f5f

```
3206420  3550 4c69 7374 4650 633a 4629 302c 3229 005f 5f30 7468 6973 3a70 2830 2c38 3129 005f 5f30 733a 7028 302c 3331 2900 5f5f
3206500  3074 6869 733a 7228 302c 3831 2900 5f5f 3174 3a28 302c 3736 2900 5f5f 305f 5f4b 3530 3a28 302c 3738 2900 5f5f 3074 6869
3206560  7320 3a5a 746c 005f 5f30 7320 3a5a 746c 005f 5f31 7420 3a5a 746c 005f 5f30 5f5f 4b35 3020 3a5a 746c 0065 7870 6c61 696e
3206640  5f5f 3550 4c69 7374 4650 6320 3a5a 7446 0053 6f72 745f 504c 6971 745f 5f35 504c 6973 7446 693a 4628 302c 3229 005f 5f30
3206720  7468 6973 3a70 2830 2c38 3129 005f 5f30 4f72 6465 723a 7028 302c 3129 005f 5f30 7468 6973 3a72 2830 2c38 3129 005f 5f31
3207000  4865 6164 4f66 4c69 7374 3a28 302c 3736 2900 5f5f 3174 3a28 302c 3736 2900 5f5f 314c 5074 723a 2830 2c37 3629 005f 5f31
3207060  4e4c 5074 723a 2830 2c37 3629 005f 5f31 4c61 7374 4c50 7472 3a28 302c 3736 2900 5f5f 3163 7572 723a 2830 2c37 3829 005f
3207140  5f31 4e65 7750 7472 3a28 302c 3832 2900 5f5f 3153 746f 703a 2830 2c31 2900 5f5f 3141 6674 6572 3a28 302c 3129 005f 5f30
3207220  5f5f 5074 6869 7330 3071 306f 7865 693a 2830 2c38 3229 005f 5f30 5f5f 586e 3030 7130 6f78 6569 3a28 302c 3738 2900 5f5f
3207300  305f 5f58 7468 6973 3030 797a 6d78 6770 3a28 302c 3736 2900 5f5f 305f 5f58 6f30 3079 7a6d 7867 703a 2830 2c37 3629 005f
3207360  5f30 7468 6973 203a 5a74 6c00 5f5f 304f 7264 6572 203a 5a74 6c00 5f5f 3148 6561 644f 664c 6973 7420 3a5a 746c 005f 5f31
3207440  7420 3a5a 746c 005f 5f31 4c50 7472 203a 5a74 6c00 5f5f 314e 4c50 7472 203a 5a74 6c00 5f5f 314c 6173 744c 5074 7220 3a5a
3207520  746c 005f 5f31 6375 7272 203a 5a74 6c00 5f5f 314e 6577 5074 7220 3a5a 746c 005f 5f31 5374 6f70 203a 5a74 6c00 5f5f 3141
3207600  6674 6572 203a 5a74 6c00 5f5f 305f 5f58 7468 6973 3030 7130 6f78 6569 203a 5a74 6c00 5f5f 305f 5f58 6e30 3071 306f 7865
3207660  6920 3a5a 746c 005f 5f30 5f5f 5874 6869 7330 3079 7a6d 7867 7020 3a5a 746c 005f 5f30 5f5f 586f 3030 797a 6d78 6770 203a
3207740  5a74 6c00 536f 7274 5f50 4c69 7374 5f5f 3553 4c69 7374 4669 203a 5a74 4600 7265 7665 7273 655f 5f35 504c 6973 7446 763a
3210020  4628 302c 3229 005f 5f30 7468 6973 3a70 2830 2c38 3129 005f 5f30 7468 6973 3a72 2830 2c38 3129 005f 5f31 743a 2830 2c37
3210100  3629 005f 5f30 5f5f 5874 6869 7330 3071 306f 7869 6b3a 2830 2c38 3229 005f 5f30 5f5f 586e 3030 7130 6f78 696b 3a28 302c
3210160  3738 2900 5f5f 305f 5f58 7468 6973 3030 797a 6d78 6770 3a28 302c 3736 2900 5f5f 305f 5f58 6f30 3079 7a6d 7867 703a 2830
3210240  2c37 3629 005f 5f30 7468 6973 203a 5a74 6c00 5f5f 3174 203a 5a74 6c00 5f5f 305f 5f58 7468 6973 3030 7130 6f78 696b 203a
3210320  5a74 6c00 5f5f 305f 5f58 6e30 3071 306f 7869 6b20 3a5a 746c 005f 5f30 5f5f 5874 6869 7330 3079 7a6d 7867 7020 3a5a 746c
3210400  005f 5f30 5f5f 586f 3030 797a 6d78 6770 203a 5a74 6c00 7265 7665 7273 655f 5f35 504c 6973 7446 7620 3a5a 7446 005f 5f73
3210460  7469 5f5f 504c 6973 745f 6462 5f63 7878 5f69 6e73 6572 745f 3a46 2830 2c32 2900 2f75 7372 2f43 432f 7375 6e34 2f69 6e63
3210540  6c2f 696f 7374 7265 616d 2e68 005f 5f73 7464 5f5f 504c 6973 745f 6462 5f63 7878 5f69 6e73 6572 745f 3a46 2830 2c32 2900
3210620  5f5f 7674 626c 5f5f 3550 4c69 7374 3a47 2830 2c38 3429 3d61 7228 302c 3129 3b30 3b36 3b28 302c 3135 2900 5f5f 7674 626c
3210700  5f5f 384c 504f 626a 6563 745f 5f50 4c69 7374 5f64 625f 6378 783a 4728 302c 3835 293d 6172 2830 2c31 293b 303b 333b 2830
3210760  2c31 3529 0065 7870 6c61 696e 5f5f 384c 504f 626a 6563 7446 5063 3a66 2830 2c32 2900 5f5f 3074 6869 733a 7028 302c 3832
3211040  2900 5f5f 3073 3a70 2830 2c33 3129 002f 686f 6d65 2f6f 7361 7331 2f61 2f61 622f 7372 632f 6e65 776f 626a 6563 7473 2f68
3211120  7878 2f4c 504f 626a 6563 745f 6462 2e68 7878 005f 5f30 7468 6973 3a72 2830 2c38 3229 005f 5f30 7468 6973 203a 5a74 6c00
3211200  5f5f 3073 203a 5a74 6c00 6578 706c 6169 6e5f 5f38 4c50 4f62 6a65 6374 4650 6320 3a5a 7446 0069 6e4f 7264 6572 5f5f 364f
3211260  626a 6563 7446 5036 4f62 6a65 6374 3a66 2830 2c31 2900 5f5f 3074 6869 733a 7028 302c 3836 293d 2a28 302c 3731 2900 5f5f
3211340  305f 5f41 3237 3a70 2830 2c38 3629 002f 686f 6d65 2f6f 7361 7331 2f61 2f61 622f 7372 632f 6e65 776f 626a 6563 7473 2f68
3211420  7878 2f4f 626a 6563 745f 6462 2e68 7878 005f 5f30 7468 6973 203a 5a74 6c00 5f5f 305f 5f41 3237 203a 5a74 6c00 696e 4f72
3211500  6465 725f 5f36 4f62 6a65 6374 4650 364f 626a 6563 7420 3a5a 7446 004c 6973 745f 6462 2e6f 005f 7075 745f 5f37 6f73 7472
3211560  6561 6d46 6300 5f69 6f73 7472 6561 6d5f 696e 6974 005f 7265 6d6f 7665 5f5f 344c 6973 7446 5063 005f 6578 706c 6169 6e5f
3211640  5f38 4c50 4f62 6a65 6374 4650 6300 5f69 7345 7175 616c 5f5f 344c 6973 7446 5234 4c69 7374 005f 696e 4f72 6465 725f 5f36
3211720  4f62 6a65 6374 4650 364f 626a 6563 7400 5f69 734d 656d 6265 725f 5f34 4c69 7374 4650 374c 4f62 6a65 6374 005f 6973 4d65
3212000  6d62 6572 5f5f 344c 6973 7446 5063 002f 686f 6d65 2f6f 7361 7331 2f61 2f61 622f 7372 632f 6e65 776f 626a 6563 7473 2f6c
3212060  6973 7473 2f43 2b2b 2e37 3932 392f 004c 6973 745f 6462 2e63 004c 6973 745f 6462 2e63 7878 0069 6e74 3a74 2830 2c31 293d
3212140  7228 302c 3129 3b2d 3231 3437 3438 3336 3438 3b32 3134 3734 3833 3634 373b 0063 6861 723a 7428 302c 3229 3d72 2830 2c32
3212220  293b 303b 3132 373b 006c 6f6e 673a 7428 302c 3329 3d72 2830 2c31 293b 2d32 3134 3734 3833 3634 383b 3231 3437 3438 3336
3212300  3437 3b00 7368 6f72 743a 7428 302c 3429 3d72 2830 2c31 293b 2d33 3237 3638 3b33 3237 3637 3b00 756e 7369 676e 6564 2063
3212360  6861 723a 7428 302c 3529 3d72 2830 2c31 293b 303b 3235 353b 0075 6e73 6967 6e65 6420 7368 6f72 743a 7428 302c 3629 3d72
3212440  2830 2c31 293b 303b 3635 3533 353b 0075 6e73 6967 6e65 6420 6c6f 6e67 3a74 2830 2c37 293d 7228 302c 3129 3b30 3b2d 313b
3212520  0075 6e73 6967 6e65 6420 696e 743a 7428 302c 3829 3d72 2830 2c31 293b 303b 2d31 3b00 666c 6f61 743a 7428 302c 3929 3d72
3212600  2830 2c31 293b 343b 303b 0064 6f75 626c 653a 7428 302c 3130 293d 7228 302c 3129 3b38 3b30 3b00 766f 6964 3a74 2830 2c31
3212660  3129 3d28 302c 3131 2900 3f3f 3f3a 7428 302c 3132 293d 2830 2c31 2900 5f5f 7670 7470 3a74 2830 2c31 3329 3d2a 2830 2c31
3212740  3429 3d66 2830 2c31 2900 5f5f 6d70 7472 3a54 2830 2c31 3529 3d73 3864 3a28 302c 3429 2c30 2c31 363b 693a 2830 2c34 292c
3213020  3136 2c31 363b 653a 2830 2c31 3329 2c33 322c 3332 3b3b 005f 5046 565f 3a74 2830 2c31 3629 3d2a 2830 2c31 3729 3d66 2830
3213100  2c32 2900 5f50 4649 5f3a 7428 302c 3133 2900 7374 7265 616d 706f 733a 7428 302c 3129 0073 7472 6561 6d6f 6666 3a74 2830
3213160  2c31 2900 696f 5f73 7461 7465 3a54 2830 2c31 3929 3d65 676f 6f64 6269 745f 5f69 6f5f 7374 6174 653a 302c 656f 6662 6974
3213240  5f5f 696f 5f73 7461 7465 3a31 2c66 6169 6c62 6974 5f5f 696f 5f73 7461 7465 3a32 2c62 6164 6269 745f 5f69 6f5f 7374 6174
3213320  653a 332c 6861 7264 6661 696c 5f5f 696f 5f73 7461 7465 3a34 2c3b 006f 7065 6e5f 6d6f 6465 3a54 2830 2c31 3929 3d65 696e
3213400  5f5f 6f70 656e 5f6d 6f64 653a 302c 6f75 745f 5f6f 7065 6e5f 6d6f 6465 3a31 2c61 7465 5f5f 6f70 656e 5f6d 6f64 653a 322c
3213460  6170 705f 5f6f 7065 6e5f 6d6f 6465 3a33 2c74 7275 6e63 5f5f 6f70 656e 5f6d 6f64 653a 342c 6e6f 6372 6561 7465 5f5f 6f70
```

| | | | | | | | | | | | | | | | | | | | | | | | | |
|---|---|---|---|---|---|---|---|---|---|---|---|---|---|---|---|---|---|---|---|---|---|---|---|---|
| 3213540 | 656e | 5f6d | 6f64 | 653a | 352c | 6e6f | 7265 | 706c | 6163 | 655f | 5f6f | 7065 | 6e5f | 6d6f | 6465 | 3a36 | 2c3b | 0073 | 6565 | 6b5f | 6469 | 723a | 5428 | 302c |
| 3213620 | 3230 | 293d | 6562 | 6567 | 5f5f | 7365 | 656b | 5f64 | 6972 | 3a30 | 2c63 | 7572 | 5f5f | 7365 | 656b | 5f64 | 6972 | 3a31 | 2c65 | 6e64 | 5f5f | 7365 | 656b | 5f64 |
| 3213700 | 6972 | 3a32 | 2c3b | 005f | 5f45 | 313a | 5428 | 302c | 3231 | 293d | 6573 | 6b69 | 7077 | 735f | 5f5f | 5f45 | 313a | 302c | 6c65 | 6674 | 5f5f | 5f5f | 4531 | 3a31 |
| 3213760 | 2c72 | 6967 | 6874 | 5f5f | 5f5f | 4531 | 3a32 | 2c69 | 6e74 | 6572 | 6e61 | 6c5f | 5f5f | 5f45 | 313a | 332c | 6465 | 635f | 5f5f | 5f45 | 313a | 342c | 6f63 | 745f |
| 3214040 | 5f5f | 5f45 | 313a | 352c | 6865 | 785f | 5f5f | 5f45 | 313a | 362c | 7368 | 6f77 | 6261 | 7365 | 5f5f | 5f5f | 4531 | 3a37 | 2c5c | 0073 | 686f | 7770 | 6f69 | 6e74 |
| 3214120 | 5f5f | 5f5f | 4531 | 3a38 | 2c75 | 7070 | 6572 | 6361 | 7365 | 5f5f | 5f5f | 4531 | 3a39 | 2c73 | 686f | 7770 | 6f73 | 5f5f | 5f5f | 4531 | 3a31 | 302c | 7363 | 6965 |
| 3214200 | 6e74 | 6966 | 6963 | 5f5f | 5f5f | 4531 | 3a31 | 312c | 6669 | 7865 | 645f | 5f5f | 5f45 | 313a | 3132 | 2c75 | 6e69 | 7462 | 7566 | 5f5f | 5f5f | 4531 | 3a31 | 332c |
| 3214260 | 7374 | 6469 | 6f5f | 5f5f | 5f45 | 313a | 3134 | 2c3b | 005f | 5f45 | 323a | 5428 | 302c | 3232 | 293d | 6573 | 6b69 | 7070 | 696e | 675f | 5f5f | 5f45 | 323a | 302c |
| 3214340 | 7469 | 6564 | 5f5f | 5f5f | 4532 | 3a31 | 2c3b | 0069 | 6f73 | 3a54 | 2830 | 2c32 | 3329 | 3d73 | 3630 | 6e75 | 7365 | 725f | 5f33 | 696f | 733a | 2830 | 2c31 | 292c |
| 3214420 | 302c | 3332 | 3b78 | 5f75 | 7365 | 725f | 5f33 | 696f | 733a | 2830 | 2c32 | 3729 | 3d2a | 2830 | 2c32 | 3429 | 3d78 | 7569 | 6f73 | 5f75 | 7365 | 725f | 756e | 696f |
| 3214500 | 6e3a | 2c33 | 322c | 3332 | 3b62 | 705f | 5f33 | 696f | 733a | 2830 | 2c32 | 3829 | 3d2a | 2830 | 2c32 | 3529 | 3d78 | 7373 | 7472 | 6561 | 6d62 | 7566 | 3a2c | 3634 |
| 3214560 | 2c33 | 323b | 7374 | 6174 | 655f | 5f33 | 696f | 733a | 2830 | 2c31 | 292c | 3936 | 2c33 | 323b | 6973 | 7065 | 6369 | 616c | 5f5f | 3369 | 6f73 | 3a28 | 302c | 3129 |
| 3214640 | 2c31 | 3238 | 2c33 | 323b | 6f73 | 7065 | 6369 | 616c | 5f5f | 3369 | 6f73 | 3a28 | 302c | 3129 | 2c31 | 3630 | 2c33 | 323b | 6973 | 6678 | 5f73 | 7065 | 6369 | 616c |
| 3214720 | 5f5f | 3369 | 6f73 | 3a28 | 302c | 3129 | 2c31 | 3932 | 2c33 | 323b | 6f73 | 6678 | 5f73 | 7065 | 6369 | 616c | 5f5f | 3369 | 6f73 | 3a28 | 302c | 3129 | 2c32 | 3234 |
| 3215000 | 2c33 | 323b | 5c00 | 6465 | 6c62 | 7566 | 5f5f | 3369 | 6f73 | 3a28 | 302c | 3129 | 2c32 | 3536 | 2c33 | 323b | 785f | 7469 | 655f | 5f33 | 696f | 733a | 2830 | 2c32 |
| 3215060 | 3929 | 3d2a | 2830 | 2c32 | 3629 | 3d78 | 736f | 7374 | 7265 | 616d | 3a2c | 3238 | 382c | 3332 | 3b78 | 5f66 | 6c61 | 6773 | 5f5f | 3369 | 6f73 | 3a28 | 302c | 3129 |
| 3215140 | 2c33 | 3230 | 2c33 | 323b | 785f | 7072 | 6563 | 6373 | 696f | 6e5f | 5f33 | 696f | 733a | 2830 | 2c34 | 292c | 3335 | 322c | 3136 | 3b78 | 5f66 | 696c | 6c5f | 5f33 |
| 3215220 | 696f | 733a | 2830 | 2c32 | 292c | 3336 | 382c | 303b | 785f | 7769 | 6474 | 685f | 5f33 | 696f | 733a | 2830 | 2c34 | 292c | 3338 | 342c | 3136 | 3b61 | 7373 | 6967 |
| 3215300 | 6e5f | 7072 | 6976 | 6174 | 655f | 5f33 | 696f | 733a | 2830 | 2c31 | 292c | 3431 | 362c | 3332 | 3b5f | 5f76 | 7074 | 725f | 5f33 | 696f | 733a | 2830 | 2c33 | 3029 |
| 3215360 | 3d2a | 2930 | 2c31 | 3529 | 2c34 | 3438 | 2c33 | 323b | 3b00 | 6261 | 7365 | 6669 | 656c | 645f | 5f33 | 696f | 733a | 4728 | 302c | 3129 | 0061 | 646a | 7573 | 7466 |
| 3215440 | 6965 | 6c64 | 5f5f | 3369 | 6f73 | 3a47 | 2830 | 2c31 | 2900 | 666c | 6f61 | 7466 | 6965 | 6c64 | 5f5f | 3369 | 6f73 | 3a47 | 2830 | 2c31 | 2900 | 6e65 | 7874 | 6269 |
| 3215520 | 745f | 5f33 | 696f | 733a | 4728 | 302c | 3129 | 006e | 6578 | 7477 | 6f72 | 645f | 5f33 | 696f | 733a | 4728 | 302c | 3129 | 0073 | 7464 | 696f | 666c | 7573 | 685f |
| 3215600 | 5f33 | 696f | 733a | 4728 | 302c | 3136 | 2900 | 696f | 733a | 5a63 | 696f | 733b | 3b5f | 5f63 | 745f | 5f33 | 696f | 7346 | 5039 | 7374 | 7265 | 6163 | 6275 | 6620 |
| 3215660 | 5f5f | 6374 | 5f5f | 3369 | 6f73 | 4676 | 205f | 5f63 | 745f | 5f33 | 696f | 7346 | 5233 | 696f | 7320 | 5f5f | 6474 | 5f5f | 3369 | 6f73 | 4676 | 2066 | 6c61 | 6773 |
| 3215740 | 5f5f | 3369 | 6f73 | 4676 | 2066 | 6c61 | 6773 | 5f5f | 3369 | 6f73 | 466c | 2073 | 6574 | 665f | 5f33 | 696f | 7346 | 6c54 | 3120 | 7365 | 7466 | 5f5f | 3369 | 6f73 |
| 3216020 | 466c | 2075 | 6e73 | 6574 | 665f | 5f33 | 696f | 7346 | 6c20 | 7769 | 6474 | 685f | 5f33 | 696f | 7346 | 7620 | 7769 | 6474 | 685f | 5f33 | 696f | 7346 | 6920 | 7469 |
| 3216100 | 655f | 5f33 | 696f | 7346 | 5037 | 6f73 | 7472 | 6561 | 6d20 | 5c00 | 7469 | 655f | 5f33 | 696f | 7346 | 7620 | 6669 | 6c6c | 5f5f | 3369 | 6f73 | 4663 | 2066 | 696c |
| 3216160 | 6c5f | 5f33 | 696f | 7346 | 7620 | 7072 | 6563 | 6973 | 696f | 6e5f | 5f33 | 696f | 7346 | 6920 | 7072 | 6563 | 6973 | 696f | 6e5f | 5f33 | 696f | 7346 | 7620 | 7264 |
| 3216240 | 7374 | 6174 | 655f | 5f33 | 696f | 7346 | 7620 | 5f5f | 6f70 | 5076 | 5f5f | 3369 | 6f73 | 4676 | 205f | 5f6e | 745f | 5f33 | 696f | 7346 | 7620 | 656f | 665f | 5f33 |
| 3216320 | 696f | 7346 | 7620 | 6661 | 696c | 5f5f | 3369 | 6f73 | 4676 | 2062 | 6164 | 5f5f | 3369 | 6f73 | 4676 | 2067 | 6f6f | 645f | 5f33 | 696f | 7346 | 7620 | 636c | 6561 |
| 3216400 | 725f | 5f33 | 696f | 7346 | 6920 | 7264 | 6275 | 665f | 5f33 | 696f | 7346 | 7620 | 5c00 | 6977 | 6f72 | 645f | 5f33 | 696f | 7346 | 6920 | 7077 | 6f72 | 645f | 5f33 |
| 3216460 | 696f | 7346 | 6920 | 6269 | 7461 | 6c6c | 6f63 | 5f5f | 3369 | 6f73 | 5346 | 7620 | 7861 | 6c6c | 6f63 | 5f5f | 3369 | 6f73 | 5346 | 7620 | 7572 | 6573 | 697a | 655f |
| 3216540 | 5f33 | 696f | 7346 | 6920 | 7379 | 6e63 | 5f77 | 6974 | 685f | 7374 | 6469 | 6f5f | 5f33 | 696f | 7353 | 4676 | 2073 | 6574 | 7374 | 6174 | 655f | 5f33 | 696f | 7346 |
| 3216620 | 6920 | 696e | 6974 | 5f5f | 3369 | 6f73 | 4650 | 3973 | 7472 | 6561 | 6d62 | 7566 | 205f | 5f61 | 735f | 5f33 | 696f | 7346 | 5233 | 696f | 7320 | 736b | 6970 | 5f5f |
| 3216700 | 3369 | 6f73 | 4669 | 203b | 6261 | 7365 | 6669 | 656c | 645f | 5f33 | 696f | 7320 | 5c00 | 6164 | 6a75 | 7374 | 6669 | 656c | 645f | 5f33 | 696f | 7320 | 666c | 6f61 |
| 3216760 | 7466 | 6965 | 6c64 | 5f5f | 3369 | 6f73 | 206e | 6578 | 7462 | 6974 | 5f5f | 3369 | 6f73 | 206e | 6578 | 7477 | 6f72 | 645f | 5f33 | 696f | 7320 | 7374 | 6469 | 6f66 |
| 3217040 | 6c75 | 7368 | 5f5f | 3369 | 6f73 | 203b | 3b00 | 7374 | 7265 | 616d | 6275 | 663a | 5428 | 302c | 3235 | 293d | 7334 | 3061 | 6c6c | 6f63 | 5f5f | 3973 | 7472 | 6561 |
| 3217120 | 6d62 | 7566 | 3a28 | 302c | 3429 | 2c30 | 2c31 | 363b | 785f | 756e | 6275 | 665f | 5f39 | 7374 | 7265 | 616d | 6275 | 663a | 2830 | 2c34 | 292c | 3136 | 2c31 | 363b |
| 3217200 | 785f | 6261 | 7365 | 5f5f | 3973 | 7472 | 6561 | 6d62 | 7566 | 3a28 | 302c | 3331 | 293d | 2a28 | 302c | 3229 | 2c33 | 322c | 3332 | 3b78 | 5f70 | 6261 | 7365 | 5f5f |
| 3217260 | 3973 | 7472 | 6561 | 6d62 | 7566 | 3a28 | 302c | 3331 | 292c | 3634 | 2c33 | 323b | 785f | 7070 | 7472 | 5f5f | 3973 | 7472 | 6561 | 6d62 | 7566 | 3a28 | 302c | 3331 |
| 3217340 | 292c | 3936 | 2c33 | 323b | 785f | 6570 | 7074 | 725f | 5f39 | 7374 | 7265 | 616d | 6275 | 663a | 2830 | 2c33 | 3129 | 2c31 | 3238 | 2c33 | 323b | 785f | 6770 | 7472 |
| 3217420 | 5f5f | 3973 | 7472 | 6561 | 6d62 | 7566 | 3a28 | 302c | 3331 | 292c | 3136 | 302c | 3332 | 3b78 | 5f65 | 6770 | 7472 | 5f5f | 3973 | 7472 | 6561 | 6d62 | 7566 | 3a28 |
| 3217500 | 302c | 3331 | 292c | 3139 | 322c | 3332 | 3b5c | 0078 | 5f65 | 6261 | 636b | 5f5f | 3973 | 7472 | 6561 | 6d62 | 7566 | 3a28 | 302c | 3331 | 292c | 3232 | 342c | 3332 |
| 3217560 | 3b78 | 5f62 | 6c65 | 6e5f | 5f39 | 7374 | 7265 | 616d | 6275 | 663a | 2930 | 2c31 | 292c | 3235 | 362c | 3332 | 3b5f | 5f76 | 7074 | 725f | 5f39 | 7374 | 7265 | 616d |
| 3217640 | 6275 | 663a | 2830 | 2c33 | 3029 | 2c32 | 3838 | 2c33 | 323b | 3b00 | 7374 | 7265 | 616d | 6275 | 663a | 5a63 | 7374 | 7265 | 616d | 6275 | 663b | 3b5f | 5f63 | 745f |
| 3217720 | 5f39 | 7374 | 7265 | 616d | 6275 | 6646 | 5239 | 7374 | 7265 | 616d | 6275 | 6620 | 5f5f | 6374 | 5f5f | 3973 | 7472 | 6561 | 6d62 | 7566 | 4676 | 205f | 5f63 | 745f |
| 3220000 | 5f39 | 7374 | 7265 | 616d | 6275 | 6646 | 5063 | 6920 | 5f5f | 6374 | 5f5f | 3973 | 7472 | 6561 | 6d62 | 7566 | 4650 | 6369 | 5432 | 205f | 5f61 | 735f | 5f39 | 7374 |
| 3220060 | 7265 | 616d | 6275 | 6646 | 5239 | 7374 | 7265 | 616d | 6275 | 6620 | 6462 | 705f | 5f39 | 7374 | 7265 | 616d | 6275 | 6646 | 7620 | 6261 | 7365 | 5f5f | 3973 | 7472 |
| 3220140 | 6561 | 6d62 | 7566 | 4676 | 2070 | 6261 | 7365 | 5f5f | 3973 | 7472 | 6561 | 6d62 | 7566 | 4676 | 205c | 0070 | 7074 | 725f | 5f39 | 7374 | 7265 | 616d | 6275 | 6646 |
| 3220220 | 7620 | 6570 | 7074 | 725f | 5f39 | 7374 | 7265 | 616d | 6275 | 6646 | 7620 | 6770 | 7472 | 5f5f | 3973 | 7472 | 6561 | 6d62 | 7566 | 4676 | 2065 | 6770 | 7472 | 5f5f |
| 3220300 | 3973 | 7472 | 6561 | 6d62 | 7566 | 4676 | 2065 | 6261 | 636b | 5f5f | 3973 | 7472 | 6561 | 6d62 | 7566 | 4676 | 2065 | 6275 | 665f | 5f39 | 7374 | 7265 | 616d | 6275 |
| 3220360 | 6646 | 7620 | 626c | 656e | 5f5f | 3973 | 7472 | 6561 | 6d62 | 7566 | 4676 | 2073 | 6574 | 705f | 5f39 | 7374 | 7265 | 616d | 6275 | 6646 | 5063 | 5431 | 2073 | 6574 |
| 3220440 | 675f | 5f39 | 7374 | 7265 | 616d | 6275 | 6646 | 5063 | 4e32 | 3120 | 7062 | 756d | 705f | 5f39 | 7374 | 7265 | 616d | 6275 | 6646 | 6920 | 5c00 | 6762 | 756d | 705f |
| 3220520 | 5f39 | 7374 | 7265 | 616d | 6275 | 6646 | 6920 | 7365 | 7462 | 5f5f | 3973 | 7472 | 6561 | 6d62 | 7566 | 4650 | 6354 | 3169 | 2075 | 6e62 | 7566 | 6665 | 7265 | 645f |
| 3220600 | 5f39 | 7374 | 7265 | 616d | 6275 | 6646 | 7620 | 756e | 6275 | 6666 | 6572 | 6564 | 5f5f | 3973 | 7472 | 6561 | 6d62 | 7566 | 4669 | 2061 | 6c6c | 6f63 | 6174 | 655f |

```
3220660  5f39 7374 7265 616d 6275 6646 7620 646f 616c 6c6f 6361 7465 5f5f 3973 7472 6561 6d62 7566 4676 206f 7665 7266 6c6f 775f
3220740  5f39 7374 7265 616d 6275 6646 6920 756e 6465 7266 6c6f 775f 5f39 7374 7265 616d 6275 6646 7620 5c00 7062 6163 6b66 6169
3221020  6c5f 5f39 7374 7265 616d 6275 6646 6920 7379 6e63 5f5f 3973 7472 6561 6d62 7566 4676 2073 6565 6b6f 6666 5f5f 3973 7472
3221100  6561 6d62 7566 466c 3873 6565 6b5f 6469 7269 2073 6565 6b73 6f73 5f5f 3973 7472 6561 6d62 7566 466c 6920 7873 7075 746e
3221160  5f5f 3973 7472 6561 6d62 7566 4650 4363 6920 7873 6765 746e 5f5f 3973 7472 6561 6d62 7566 4650 6369 2069 6e5f 6176 6169
3221240  6c5f 5f39 7374 7265 616d 6275 6646 7620 6f75 745f 7761 6974 696e 675f 5f39 7374 7265 6161 6275 6646 7620 5c00 7367 6574
3221320  635f 5f39 7374 7265 616d 6275 6646 7620 736e 6578 7463 5f5f 3973 7472 6561 6d62 7566 4676 2073 6275 6d70 635f 5f39 7374
3221400  7265 616d 6275 6646 7620 7374 6f73 7363 5f5f 3973 7472 6561 6d62 7566 4676 2073 7075 7462 6163 6b63 5f5f 3973 7472 6561
3221460  6d62 7566 4663 2073 7075 7463 5f5f 3973 7472 6561 6d62 7566 4669 2073 7075 746e 5f5f 3973 7472 6561 6d62 7566 4650 4363
3221540  6920 7367 6574 6e5f 5f39 7374 7265 616d 6275 6646 5063 6920 7365 7462 7566 5f5f 3973 7472 6561 6d62 7566 4650 6369 205c
3221620  0073 6574 6275 665f 5f39 7374 7265 616d 6275 6646 5055 6369 2073 6574 6275 665f 5f39 7374 7265 616d 6275 6646 5063 6954
3221700  3220 5f5f 6474 5f5f 3973 7472 6561 6d62 7566 4676 2078 5f73 6e65 7874 635f 5f39 7374 7265 616d 6275 6646 7620 3b3b 3b00
3221760  6973 7472 6561 6d3a 5428 302c 3332 293d 7337 3278 5f67 636f 756e 745f 5f37 6973 7472 6561 6d3a 2830 2c31 292c 302c 3332
3222040  3b5f 5f76 7074 725f 5f37 6973 7472 6561 6d3a 2830 2c33 3029 2c33 322c 3332 3b50 696f 733a 2830 2c33 3329 3b2a 2830 2c32
3222120  3329 2c36 342c 3332 3b4f 696f 733a 2830 2c32 3329 2c39 362c 3438 303b 3b00 6973 7472 6561 6d3a 5a63 6973 7472 6561 6d3b
3222200  696f 733b 5f5f 6374 5f5f 3769 7374 7265 616d 4650 3973 7472 6561 6d62 7566 205f 5f63 745f 5f37 6973 7472 6561 6d46 7620
3222260  5f5f 6374 5f5f 3769 7374 7265 616d 4650 3973 7472 6561 6d62 7566 6950 376f 7374 7265 616d 205f 5f63 745f 5f37 6973 7472
3222340  6561 6d46 6950 6354 3120 5f5f 6374 5f5f 3769 7374 7265 616d 4669 5431 5037 6f73 7472 6561 6d20 5f5f 6374 5f5f 3769 7374
3222420  7265 616d 4652 3769 7374 7265 616d 205f 5f64 745f 5f37 6973 7472 6561 6d46 7620 5c00 6970 6678 5f5f 3769 7374 7265 616d
3222500  4669 2069 7366 785f 5f37 6973 7472 6561 6d46 7620 7365 656b 675f 5f37 6973 7472 6561 6d46 6c20 7365 656b 675f 5f37 6973
3222560  7472 6561 6d46 6c38 7365 656b 5f64 6972 2074 656c 6c67 5f5f 3769 7374 7265 616d 4676 205f 5f72 735f 5f37 6973 7472 6561
3222640  6d46 5046 5237 6973 7472 6561 6d5f 5237 6973 7472 6561 6d20 5f5f 7273 5f5f 3769 7374 7265 616d 4650 4652 3369 6f73 5f52
3222720  3369 6f73 205f 5f72 735f 5f37 6973 7472 6561 6d46 5063 205f 5f72 735f 5f37 6973 7472 6561 6d46 5055 6320 5c00 5f5f 7273
3223000  5f5f 3769 7374 7265 616d 4652 5563 205f 5f72 735f 5f37 6973 7472 6561 6d46 5263 205f 5f72 735f 5f37 6973 7472 6561 6d46
3223060  5273 205f 5f72 735f 5f37 6973 7472 6561 6d46 5269 205f 5f72 735f 5f37 6973 7472 6561 6d46 526c 205f 5f72 735f 5f37 6973
3223140  7472 6561 6d46 5255 7320 5f5f 7273 5f5f 3769 7374 7265 616d 4652 5569 205f 5f72 735f 5f37 6973 7472 6561 6d46 5255 6c20
3223220  5f5f 7273 5f5f 3769 7374 7265 616d 4652 6620 5f5f 7273 5f5f 3769 7374 7265 616d 4652 6420 5f5f 7273 5f5f 3769 7374 7265
3223300  616d 4650 3973 7472 6561 6d62 7566 205c 0067 6574 5f5f 3769 7374 7265 616d 4650 6369 6320 6765 745f 5f37 6973 7472 6561
3223360  6d46 5055 6369 6320 6765 745f 5f37 6973 7472 6561 6d46 5269 205f 5239 7374 7265 616d 6275 6663 2067 6574 5f5f 3769 7374
3223440  4652 5563 2067 6574 5f5f 3769 7374 7265 616d 4652 6320 6765 745f 5f37 6973 7472 6561 6d46 7620 6765 746c 696e 655f 5f37
3223520  6973 7472 6561 6146 5063 6963 2067 6574 6c69 6e65 5f5f 3769 7374 7265 616d 4650 5563 6963 2070 6565 6b5f 5f37 6973 7472
3223600  6561 6d46 7620 6967 6e6f 7265 5f5f 3769 7374 7265 616d 4669 5431 205c 0072 6561 645f 5f37 6973 7472 6561 6d46 5063 6920
3223660  7265 6164 5f5f 3769 7374 7265 616d 4650 5563 6920 6763 6f75 6e74 5f5f 3769 7374 7265 616d 4676 2070 7574 6261 636b 5f5f
3223740  3769 7374 7265 616d 4663 2073 796e 635f 5f37 6973 7472 6561 6d46 7620 646f 5f69 7066 785f 5f37 6973 7472 6561 6d46 6920
3224020  6561 7477 6869 7465 5f5f 3769 7374 7265 616d 4576 2078 6765 745f 5f37 6973 7472 6561 6d46 5063 203b 3b3b 006f 7374 7265
3224100  616d 3a54 2830 2c32 3629 3373 3638 5f5f 7670 7472 5f5f 376f 7374 7265 616d 3a28 302c 3330 292c 302c 3332 3b50 696f 733a
3224160  2830 2c33 3329 2c33 322c 3332 3b4f 696f 733a 2830 2c32 3329 2c36 342c 3438 303b 3b00 6f73 7472 6561 6d3a 5a63 6f73 7472
3224240  6561 6d3b 696f 733b 5f5f 6374 5f5f 376f 7374 7265 616d 4650 3973 7472 6561 6d62 7566 205f 5f63 745f 5f37 6f73 7472 6561
3224320  6d46 7620 5f5f 6374 5f5f 376f 7374 7265 616d 4669 205f 5f63 745f 5f37 6f73 7472 6561 6d46 6950 6320 5f5f 6374 5f5f 376f
3224400  7374 7265 616d 4652 376f 7374 7265 616d 205f 5f64 745f 5f37 6f73 7472 6561 6d46 7620 6f70 6678 5f5f 376f 7374 7265 616d
3224460  4676 206f 7366 785f 5f37 6f73 7472 6561 6d46 7620 666c 7573 685f 5f37 6f73 7472 6561 6d46 7620 5c00 7365 656b 705f 5f37
3224540  6f73 7472 6561 6146 6c20 7365 656b 705f 5f37 6f73 7472 6561 6d46 6c38 7365 656b 5f64 6972 2074 656c 6c70 5f5f 376f 7374
3224620  7265 616d 4676 2070 7574 5f5f 376f 7374 7265 616d 4663 205f 5f6c 735f 5f37 6f73 7472 6561 6d46 6320 5f5f 6c73 5f5f 376f
3224700  7374 7265 616d 4655 6320 5f5f 6c73 5f5f 376f 7374 7265 616d 4650 4363 205f 5f6c 735f 5f37 6f73 7472 6561 6d46 6920 5f5f
3224760  6c73 5f5f 376f 7374 7265 616d 466c 205f 5f6c 735f 5f37 6f73 7472 6561 6d46 6420 5f5f 6c73 5f5f 376f 7374 7265 616d 4666
3225040  205c 005f 5f6c 735f 5f37 6f73 7472 6561 6d46 5569 205f 5f6c 735f 5f37 6f73 7472 6561 6d46 556c 205f 5f6c 735f 5f37 6f73
3225120  7472 6561 6d46 5376 205f 5f6c 735f 5f37 6f73 7472 6561 6d46 5039 7374 7265 616d 6275 6620 5f5f 6c73 5f5f 376f 7374 7265
3225200  616d 4673 205f 5f6c 735f 5f37 6f73 7472 6561 6d46 5573 205f 5f6c 735f 5f37 6f73 7472 6561 6d46 5046 5237 6f73 7472 6561
3225260  6d5f 5237 6f73 7472 6561 6d20 5f5f 6c73 5f5f 376f 7374 7265 616d 4650 4652 3369 6f73 5f52 3369 6f73 2077 7269 7465 5f5f
3225340  376f 7374 7265 616d 4650 4363 6920 5c00 7772 6974 655f 5f37 6f73 7472 6561 6d46 5043 5563 6920 646f 5f6f 7066 785f 5f37
3225420  6f73 7472 6561 6146 7620 646f 5f6f 7366 785f 5f37 6f73 7472 6561 6d46 7620 3b3b 3b00 7075 745f 5f37 6f73 7472 6561 6d46
3225500  633a 6628 302c 3334 293d 2a28 302c 3236 2900 5f5f 3074 6869 733a 7028 302c 3334 2900 5f5f 3063 3a70 2830 2c32 2900 2f75
3225560  7372 2f43 432f 7375 6e34 2f69 6e63 6c2f 696f 7374 7265 616d 2e68 005f 5f30 7468 6973 3a72 2830 2c33 3429 005f 5f30 7468
3225640  6973 203a 5a74 6c00 5f5f 3063 203a 5a74 6c00 7075 745f 5f37 6f73 7472 6561 6d46 6320 3a5a 7446 0069 6f73 7472 6561 6d3a
3225720  5428 302c 3335 293d 7338 3079 5f67 636f 756e 745f 5f37 6973 7472 6561 6d3a 2830 2c31 292c 302c 3332 3b5f 5f76 7074 725f
```

```
3226000 5f37 6973 7472 6561 6d3a 2830 2c33 3029 2c33 322c 3332 3b50 696f 733a 2830 2c33 3329 2c36 342c 3332 3b4f 6f73 7472 6561
3226060 6d3a 2830 2c32 3629 2c39 362c 3534 343b 3b00 696f 7374 7265 616d 3a5a 6369 6f73 7472 6561 6d3b 6973 7472 6561 6d20 6f73
3226140 7472 6561 6d20 696f 733b 5f5f 6374 5f5f 3869 6f73 7472 6561 6146 5039 7374 7265 616d 6275 6620 5f5f 6374 5f5f 3869 6f73
3226220 7472 6561 6d46 7620 5f5f 6374 5f5f 3869 6f73 7472 6561 6d46 5238 696f 7374 7265 616d 205f 5f64 745f 5f38 696f 7374 7265
3226300 616d 4676 203b 3b3b 0063 696e 3a47 2830 2c33 3629 3d78 7369 7374 7265 616d 5f77 6974 6861 7373 6967 6e3a 0063 6f75 743a
3226360 4728 302c 3337 293d 7873 6f73 7472 6561 6d5f 7769 7468 6173 7369 676e 3a00 6365 7272 3a47 2830 2c33 3729 0063 6c6f 673a
3226440 4728 302c 3337 2900 496f 7374 7265 616d 5f69 6e69 743a 5428 302c 3338 293d 7331 5f5f 5739 5f5f 3133 496f 7374 7265 616d
3226520 5f69 6e69 743a 2830 2c32 292c 302c 383b 3b00 7374 6473 7461 7475 735f 5f31 3349 6f73 7472 6561 6d5f 696e 6974 3a47 2830
3226600 2c31 2900 696e 6974 636f 756e 745f 5f31 3349 6f73 7472 6561 6d5f 696e 6974 3a47 2830 2c31 2900 496f 7374 7265 616d 5f69
3226660 6e69 743a 5a63 496f 7374 7265 616d 5f69 6e69 743b 3b5f 5f63 745f 5f31 3349 6f73 7472 6561 6d5f 696e 6974 4676 205f 5f64
3226740 745f 5f31 3349 6f73 7472 6561 6d5f 696e 6974 4676 203b 7374 6473 7461 7475 735f 5f31 3349 6f73 7472 6561 6d5f 696e 6974
3227020 2069 6e69 7463 6f75 6e74 5f5f 3133 496f 7374 7265 616d 5f69 6e69 7420 3b40 696f 733b 0069 6f73 7472 6561 6d5f 696e 6974
3227100 3a53 2830 2c33 3829 0047 5054 3a74 2830 2c31 3329 0073 6d61 6e69 705f 696e 743a 5428 302c 3339 293d 7338 6663 745f 5f31
3227160 3073 6d61 6e69 705f 696e 743a 2830 2c34 3029 3d2a 2830 2c34 3129 3d66 2830 2c33 3329 2c30 2c33 323b 6172 675f 5f31 3073
3227240 6d61 6e69 705f 696e 743a 2830 2c31 292c 3332 2c33 323b 3b00 736d 616e 6970 5f69 6e74 3a5a 6373 6d61 6e69 705f 696e 743b
3227320 3b5f 5f63 745f 5f31 3073 6d61 6e69 705f 696e 7446 5046 5233 696f 7369 5f52 3369 6f73 6920 3b3b 5f5f 6c73 5f5f 4652 376f
3227400 7374 7265 616d 5231 3073 6d61 6e69 705f 696e 7420 5f5f 7273 5f5f 4652 3769 7374 7265 616d 5231 3073 6d61 6e69 705f 696e
3227460 7420 3b00 7361 7070 6c79 5f69 6e74 3a54 2830 2c34 3229 3d73 3466 6374 5f5f 3130 7361 7070 6c79 5f69 6e74 3a28 302c 3430
3227540 292c 302c 3332 3b3b 0073 6170 706c 795f 696e 743a 5a63 7361 7070 6c79 5f69 6e74 3b3b 5f5f 6374 5f5f 3130 7361 7070 6c79
3227620 5f69 6e74 4650 4652 3369 6f73 695f 5233 696f 7320 5f5f 636c 5f5f 3130 7361 7070 6c79 5f69 6e74 4669 203b 3b3b 0069 6d61
3227700 6e69 705f 696e 743a 5428 302c 3433 293d 7338 6663 745f 5f31 3069 6d61 6e69 705f 696e 743a 2830 2c34 3429 3d2a 2830 2c34
3227760 3529 3d66 2830 2c34 3629 3d2a 2830 2c33 3229 2c30 2c33 323b 6172 675f 5f31 3069 6d61 6e69 705f 696e 743a 2830 2c31 292c
3230040 3332 2c33 323b 3b00 696d 616e 6970 5f69 6e74 3a5a 6369 6d61 6e69 705f 696e 743b 3b5f 5f63 745f 5f31 3069 6361 6e69 705f
3230120 696e 7446 5046 5237 6973 7472 6561 6d69 5f52 3769 7374 7265 616d 6920 3b3b 5f5f 7273 5f5f 4652 3769 7374 7265 616d 5231
3230200 3369 6d61 6e69 705f 696e 7420 3b00 6961 7070 6c79 5f69 6e74 3a54 2830 2c34 3729 3d73 3466 6374 5f5f 3130 6961 7070 6c79
3230260 5f69 6e74 3a28 302c 3434 292c 302c 3332 3b3b 0069 6170 706c 795f 696e 743a 5a63 6961 7070 6c79 5f69 6e74 3b3b 5f5f 6374
3230340 5f5f 3130 6961 7070 6c79 5f69 6e74 4650 4652 3769 7374 7265 616d 695f 5237 6973 7472 6561 6d20 5f5f 636c 5f5f 3130 6961
3230420 7070 6c79 5f69 6e74 4669 203b 3b3b 006f 6d61 6e69 705f 696e 743a 5428 302c 3438 293d 7338 6663 745f 5f31 306f 6d61 6e69
3230500 705f 696e 743a 2830 2c34 3929 3d2a 2830 2c35 3029 3466 2830 2c33 3429 2c30 2c33 323b 6172 675f 5f31 306f 6d61 6e69 705f
3230560 696e 743a 2830 2c31 292c 3332 2c33 323b 3b00 6f6d 616e 6970 5f69 6e74 3a5a 636f 6d61 6e69 705f 696e 743b 3b5f 5f63 745f
3230640 5f31 306f 6d61 6e69 705f 696e 7446 5046 5237 6f73 7472 6561 6d69 5f52 376f 7374 7265 616d 6920 3b3b 5f5f 6c73 5f5f 4652
3230720 376f 7374 7265 616d 5231 306f 6d61 6e69 705f 696e 7420 3b00 6f61 7070 6c79 5f69 6e74 3a54 2830 2c35 3129 3d73 3466 6374
3231000 5f5f 3130 6f61 7070 6c79 5f69 6e74 3a28 302c 3439 292c 302c 3332 3b3b 006f 6170 706c 795f 696e 743a 5a63 6f61 7070 6c79
3231060 5f69 6e74 3b3b 5f5f 6374 5f5f 3130 6f61 7070 6c79 5f69 6e74 4650 4652 376f 7374 7265 616d 695f 5237 6f73 7472 6561 6d20
3231140 5f5f 636c 5f5f 3130 6f61 7070 6c79 5f69 6e74 4669 203b 3b3b 0069 6f6d 616e 6970 5f69 6e74 3a54 2830 2c35 3229 3d73 3866
3231220 6374 5f5f 3131 696f 6d61 6e69 705f 696e 743a 2830 2c35 3329 3d2a 2830 2c35 3429 3d66 2830 2c35 3529 3d2a 2830 2c33 3529
3231300 2c30 2c33 323b 6172 675f 5f31 3169 6f6d 616e 6970 5f69 6e74 3a28 302c 3129 2c33 322c 3332 3b3b 0069 6f6d 616e 6970 5f69
3231360 6e74 3a5a 6369 6f6d 616e 6970 5f69 6e74 3b3b 5f5f 6374 5f5f 3131 696f 6d61 6e69 705f 696e 7446 5046 5238 696f 7374 7265
3231440 616d 695f 5238 696f 7374 7265 616d 6920 3b3b 5f5f 6c73 5f5f 4652 3869 6f73 7472 6561 6d52 3131 696f 6d61 6e69 705f 696e
3231520 7420 5f5f 7273 5f5f 4652 3869 6f73 7472 6561 6d52 3131 696f 6d61 6e69 705f 696e 7420 3b00 696f 6170 706c 795f 696e 743a
3231600 5428 302c 3536 293d 7334 6663 745f 5f31 3169 6f61 7070 6c79 5f69 6e74 3a28 302c 3533 292c 302c 3332 3b3b 0069 6f61 7070
3231660 6c79 5f69 6e74 3a5a 6369 6f61 7070 6c79 5f69 6e74 3b3b 5f5f 6374 5f5f 3131 696f 6170 706c 795f 696e 7446 5046 5238 696f
3231740 7374 7265 616d 695f 5238 696f 7374 7265 616d 205f 5f63 6c5f 5f31 3169 6f61 7070 6c79 5f69 6e74 4669 203b 3b3b 0073 6d61
3232020 6e69 705f 6c6f 6e67 3a54 2830 2c35 3729 3d73 3866 6374 5f5f 3131 736d 616e 6970 5f6c 6f6e 673a 2830 2c34 3029 2c30 2c33
3232100 323b 6172 675f 5f31 3173 6d61 6e69 705f 6c6f 6e67 3a28 302c 3129 2c33 322c 3332 3b3b 0073 6d61 6e69 705f 6c6f 6e67 3a5a
3232160 6373 6d61 6e69 705f 6c6f 6e67 3b3b 5f5f 6374 5f5f 3131 736d 616e 6970 5f6c 6f6e 6746 5046 5233 696f 736c 5f52 3369 6f73
3232240 6c20 3b3b 5f5f 6c73 5f5f 4652 376f 7374 7265 616d 5231 3173 6d61 6e69 705f 6c6f 6e67 205f 5f72 735f 5f46 5237 6973 7472
3232320 6561 6d52 3131 736d 616e 6970 5f6c 6f6e 6720 3b00 7361 7070 6c79 5f6c 6f6e 673a 5428 302c 3538 293d 7334 6663 745f 5f31
3232400 3173 6170 706c 795f 6c6f 6e67 3a28 302c 3439 292c 302c 3332 3b3b 0073 6170 706c 795f 6c6f 6e67 3a5a 6373 6170 706c 795f
3232460 6c6f 6e67 3b3b 5f5f 6374 5f5f 3131 7361 7070 6c79 5f6c 6f6e 6746 5046 5233 696f 736c 5f52 3369 6f73 205f 5f63 6c5f 5f31
3232540 3173 6170 706c 795f 6c6f 6e67 466c 203b 3b3b 0069 6d61 6e69 705f 6c6f 6e67 3a54 2830 2c35 3929 3173 3866 6374 5f5f 3131
3232620 696d 616e 6970 5f6c 6f6e 673a 2830 2c34 3429 2c30 2c33 323b 6172 675f 5f31 3169 6d61 6e69 705f 6c6f 6e67 3a28 302c 3129
3232700 2c33 322c 3332 3b3b 0069 6d61 6e69 705f 6c6f 6e67 3a5a 6369 6d61 6e69 705f 6c6f 6e67 3b3b 5f5f 6374 5f5f 3131 696d 616e
3232760 6970 5f6c 6f6e 6746 5046 5237 6973 7472 6561 6d6c 5f52 3769 7374 7265 616d 6c20 3b3b 5f5f 7273 5f5f 4652 3769 7374 7265
3233040 616d 5231 3169 6d61 6e69 705f 6c6f 6e67 203b 0069 6170 706c 795f 6c6f 6e67 3a54 2830 2c36 3029 3d73 3466 6374 5f5f 3131
```

```
3233120 6961 7070 6c79 5f6c 6f6e 673a 2830 2c34 3429 2c30 2c33 323b 3b00 6961 7070 6c79 5f6c 6f6e 673a 5a63 6961 7070 6c79 5f6c
3233200 6f6e 673b 3b5f 5f63 745f 5f31 3169 6170 706c 795f 6c6f 6e67 4650 4652 3769 7374 7265 616d 6c5f 5237 6973 7472 6561 6d20
3233260 5f5f 636c 5f5f 3131 6961 7070 6c79 5f6c 6f6e 6746 6c20 3b3b 3b00 6f6d 616e 6970 5f6c 6f6e 673a 5428 302c 3631 293d 7338
3233340 6663 745f 5f31 316f 6d61 6e69 705f 6c6f 6e67 3a28 302c 3439 292c 302c 3332 3b61 7267 5f5f 3131 6f64 616e 6970 5f6c 6f6e
3233420 673a 2830 2c31 292c 3332 2c33 323b 3b00 6f6d 616e 6970 5f6c 6f6e 673a 5a63 6f6d 616e 6970 5f6c 6f6e 673b 3b5f 5f63 745f
3233500 5f31 316f 6d61 6e69 705f 6c6f 6e67 4650 4652 376f 7374 7265 616d 6c5f 5237 6f73 7472 6561 6d6c 203b 3b5f 5f6c 735f 5f46
3233560 5237 6f73 7472 6561 6d52 3131 6f6d 616e 6970 5f6c 6f6e 6720 3b00 6f61 7070 6c79 5f6c 6f6e 673a 5428 302c 3632 293d 7334
3233640 6663 745f 5f31 316f 6170 706c 795f 6c6f 6e67 3a28 302c 3439 292c 302c 3332 3b3b 006f 6170 706c 795f 6c6f 6e67 3a5a 636f
3233720 6170 706c 795f 6c6f 6e67 3b3b 5f5f 6374 5f5f 3131 6f61 7070 6c79 5f6c 6f6e 6746 5046 5237 6f73 7472 6561 6d6c 5f52 376f
3234000 7374 7265 616d 205f 5f63 6c5f 5f31 316f 6170 706c 795f 6c6f 6e67 466c 203b 3b3b 0069 6f6d 616e 6970 5f6c 6f6e 673a 5428
3234060 302c 3633 293d 7338 6663 745f 5f31 3269 6f6d 616e 6970 5f6c 6f6e 673a 2830 2c35 3329 2c30 2c33 323b 6172 675f 5f31 3269
3234140 6f6d 616e 6970 5f6c 6f6e 673a 2830 2c31 292c 3332 2c33 323b 3b00 696f 6d61 6e69 705f 6c6f 6e67 3a5a 6369 6f6d 616e 6970
3234220 5f6c 6f6e 673b 3b5f 5f63 745f 5f31 3269 6f6d 616e 6970 5f6c 6f6e 6746 5046 5238 696f 7374 7265 616d 6c5f 5238 696f 7374
3234300 7265 616d 6c20 3b3b 5f5f 6c73 5f5f 4652 3869 6f73 7472 6561 6d52 3132 696f 6d61 6e69 705f 6c6f 6e67 205f 5f72 735f 5f46
3234360 5238 696f 7374 7265 616d 5231 3269 6f6d 616e 6970 5f6c 6f6e 6720 3b00 696f 6170 706c 795f 6c6f 6e67 3a54 2830 2c36 3429
3234440 3d73 3466 6374 5f5f 3132 696f 6170 706c 795f 6c6f 6e67 3a28 302c 3533 292c 302c 3332 3b3b 0069 6f61 7070 6c79 5f6c 6f6e
3234520 673a 5a63 696f 6170 706c 795f 6c6f 6e67 3b3b 5f5f 6374 5f5f 3132 696f 6170 706c 795f 6c6f 6e67 4650 4652 3869 6f73 7472
3234600 6561 6d6c 5f52 3969 6f73 7472 6561 6d20 5f5f 636c 5f5f 3132 696f 6170 706c 795f 6c5f 6e67 466c 203b 3b3b 0065 7272 6e6f
3234660 3a47 2830 2c31 2900 7379 735f 6e65 7272 3a47 2830 2c31 2900 7374 6469 6f62 7566 3a54 2830 2c36 3629 3d73 3532 616c 6c6f
3234740 635f 5f39 7374 7265 616d 6275 663a 2830 2c34 292c 302c 3136 3b78 5f75 6e62 7566 5f5f 3973 7472 6561 6d62 7566 3a28 302c
3235020 3429 2c31 362c 3136 3b78 5f62 6173 655f 5f39 7374 7265 616d 6275 663a 2830 2c33 3129 2c33 322c 3332 3b78 5f70 6261 7365
3235100 5f5f 3973 7472 6561 6d62 7566 3a28 302c 3331 292c 3634 2c33 323b 785f 7070 7472 5f5f 3973 7472 6561 6d62 7566 3a28 302c
3235160 3331 292c 3936 2c33 323b 785f 6570 7074 725f 5f39 7374 7265 616d 6275 663a 2830 2c33 3129 2c31 3238 2c33 323b 785f 6770
3235240 7472 5f5f 3973 7472 6561 6d62 7566 3a28 302c 3331 292c 3136 302c 3332 3b78 5f65 6770 7472 5f5f 3973 7472 6561 6d62 7566
3235320 3a28 302c 3331 292c 3139 322c 3332 3b5c 0078 5f65 6261 636b 5f5f 3973 7472 6561 6d62 7566 3a28 302c 3331 292c 3232 342c
3235400 3332 3b78 5f62 6c65 6e5f 5f39 7374 7265 616d 6275 663a 2830 2c31 292c 3235 362c 3332 3b5f 5f76 7074 725f 5f39 7374 7265
3235460 616d 6275 663a 2830 2c33 3029 2c32 3838 2c33 323b 6570 5f5f 3873 7464 696f 6275 663a 2830 2c36 3729 3d2a 2830 2c36 3529
3235540 3d78 735f 696f 6275 663a 2c33 3230 2c33 323b 6c61 7374 5f6f 705f 5f38 7374 6469 6f62 7566 3a28 302c 3129 2c33 3532 2c33
3235620 323b 6275 665f 5f38 7374 6469 6f62 7566 3a28 302c 3638 293d 6172 2830 2c31 293b 303b 313b 2830 2c32 292c 3338 342c 3136
3235700 3b3b 0073 7464 696f 6275 663a 5a63 7374 6469 6f62 7566 3b73 7472 6561 6d62 7566 3b6f 7665 7266 6c6f 775f 5f38 7374 6469
3235760 6f62 7566 4669 2075 6e64 6572 666c 6f77 5f5f 3873 7464 696f 6275 6646 7620 7379 6e63 5f5f 3873 7464 696f 6275 6646 7620
3236040 7365 656b 6f66 665f 5f38 7374 6469 6f62 7566 466c 3873 6565 6b5f 6469 7269 2070 6261 636b 6661 696c 5f5f 3873 7464 696f
3236120 6275 6646 6920 5f5f 6374 5f5f 3873 7464 696f 6275 6646 5036 5f69 6f62 7566 205f 5f63 745f 5f38 7374 6469 6f62 7566 4652
3236200 4338 7374 6469 6f62 7566 205c 0073 7464 696f 6669 6c65 5f5f 3873 7464 696f 6275 6646 7620 5f5f 6474 5f5f 3873 7464 696f
3236260 6275 6646 7620 3b3b 3b00 6669 6c65 6275 663a 5428 302c 3639 293d 7336 3461 6c6c 6f63 5f5f 3973 7472 6561 6d62 7566 3a28
3236340 302c 3429 2c30 2c31 363b 785f 756e 6275 665f 5f39 7374 7265 616d 6275 663a 2830 2c34 292c 3136 2c31 363b 785f 6261 7365
3236420 5f5f 3973 7472 6561 6d62 7566 3a28 302c 3331 292c 3332 2c33 323b 785f 7062 6173 655f 5f39 7374 7265 616d 6275 663a 2830
3236500 2c33 3129 2c36 342c 3332 3b78 5f70 7074 725f 5f39 7374 7265 616d 6275 663a 2830 2c33 3129 2c39 362c 3332 3b78 5f65 7070
3236560 7472 5f5f 3973 7472 6561 6d62 7566 3a28 302c 3331 292c 3132 382c 3332 3b78 5f67 7074 725f 5f39 7374 7265 616d 6275 663a
3236640 2830 2c33 3129 2c31 3630 2c33 323b 785f 6567 7074 725f 5f39 7374 7265 616d 6275 663a 2830 2c33 3129 2c31 3932 2c33 323b
3236720 5c00 795f 6562 6163 6b5f 5f39 7374 7265 616d 6275 663a 2830 2c33 3129 2c32 3234 2c33 323b 785f 626c 656e 5f5f 3973 7472
3237000 6561 6d62 7566 3a28 302c 3129 2c32 3536 2c33 323b 5f5f 7670 7472 5f5f 3973 7472 6561 6d62 7566 3a28 302c 3330 292c 3238
3237060 382c 3332 3b78 6664 5f5f 3766 696c 6562 7566 3a28 302c 3129 2c33 3230 2c33 323b 6d6f 6465 5f5f 3766 696c 6562 7566 3a28
3237140 302c 3129 2c33 3532 2c33 323b 6f70 656e 6564 5f5f 3766 696c 6562 7566 3a28 302c 3229 2c33 3834 2c38 3b6c 6173 745f 7365
3237220 656b 5f5f 3766 696c 6562 7566 3a28 302c 3129 2c34 3136 2c33 323b 696e 5f73 7461 7274 5f5f 3766 696c 6562 7566 3a28 302c
3237300 3331 292c 3434 382c 3332 3b6c 6168 6561 645f 5f37 6669 6c65 6275 663a 2830 2c36 3829 2c34 3830 2c31 363b 3b00 6f70 656e
3237360 7072 6f74 5f5f 3766 696c 6562 7566 3a47 2830 2c31 2900 6669 6c65 6275 663a 5a63 6669 6c65 6275 663b 7374 7265 616d 6275
3237440 663b 5f5f 6374 5f5f 3766 696c 6562 7566 4676 205f 5f63 745f 5f37 6669 6c65 6275 6646 6920 5f5f 6374 5f5f 3766 696c 6562
3237520 7566 4669 5063 5431 205f 5f63 745f 5f37 6669 6c65 6275 6646 5243 3766 696c 6562 7566 2069 735f 6f70 656e 5f5f 3766 696c
3237600 6562 7566 4676 2066 645f 5f37 6669 6c65 6275 6646 7620 6f70 656e 5f5f 3766 696c 6562 7566 4650 4363 6954 3220 6174 7461
3237660 6368 5f5f 3766 696c 6562 7566 4669 2063 6c6f 7365 5f5f 3766 696c 6562 7566 4676 205c 005f 5f64 745f 5f37 6669 6c65 6275
3237740 6646 7620 6f76 6572 666c 6f77 5f5f 3766 696c 6562 7566 4669 2075 6e64 6572 666c 6f77 5f5f 3766 696c 6562 7566 4676 2073
3240020 796e 635f 5f37 6669 6c65 6275 6646 7620 7365 656b 6f66 665f 5f37 6669 6c65 6275 6646 6c38 7365 656b 5f64 6972 6920 7365
3240100 7462 7566 5f5f 3766 696c 6562 7566 4650 6369 206c 6173 745f 6f70 5f5f 3766 696c 6562 7566 4676 203b 6f70 656e 7072 6f74
3240160 5f5f 3766 696c 6562 7566 203b 3b00 6673 7472 6561 6d62 6173 653a 5428 302c 3730 293d 7331 3332 6275 665f 5f31 3166 7374
```

| | | | | | | | | | | | | | | | | | | | | | | | | |
|---|---|---|---|---|---|---|---|---|---|---|---|---|---|---|---|---|---|---|---|---|---|---|---|---|
| 3240240 | 7265 | 616d | 6261 | 7365 | 3a28 | 302c | 3639 | 292c | 302c | 3531 | 323b | 5f5f | 7670 | 7472 | 5f5f | 3131 | 6673 | 7472 | 6561 | 6d62 | 6173 | 653a | 2830 | 2c33 |
| 3240320 | 3029 | 2c35 | 3132 | 2c33 | 323b | 5069 | 6f73 | 3a28 | 302c | 3333 | 292c | 3534 | 342c | 3332 | 3b4f | 696f | 733a | 2830 | 2c32 | 3329 | 2c35 | 3736 | 2c34 | 3830 |
| 3240400 | 3b3b | 0066 | 7374 | 7265 | 616d | 6261 | 7365 | 3a5a | 6366 | 7374 | 7265 | 616d | 6261 | 7365 | 3b69 | 6f73 | 3b5f | 5f63 | 745f | 5f31 | 3166 | 7374 | 7265 | 616d |
| 3240460 | 6261 | 7365 | 4676 | 205f | 5f63 | 745f | 5f31 | 3166 | 7374 | 7265 | 616d | 6261 | 7365 | 4650 | 4363 | 6954 | 3220 | 5f5f | 6374 | 5f5f | 3131 | 6673 | 7472 | 6561 |
| 3240540 | 6d62 | 6173 | 6546 | 6920 | 5f5f | 6374 | 5f5f | 3131 | 6673 | 7472 | 6561 | 6d62 | 6173 | 6546 | 6950 | 6354 | 3120 | 5f5f | 6374 | 5f5f | 3131 | 6673 | 7472 | 6561 |
| 3240620 | 6d62 | 6173 | 6546 | 5231 | 3166 | 7374 | 7265 | 616d | 6261 | 7365 | 205f | 5f64 | 745f | 5f31 | 3166 | 7374 | 7265 | 616d | 6261 | 7365 | 4676 | 206f | 7065 | 6e5f |
| 3240700 | 5f31 | 3166 | 7374 | 7265 | 616d | 6261 | 7365 | 4650 | 4363 | 6954 | 3220 | 5c00 | 6174 | 7461 | 6368 | 5f5f | 3131 | 6673 | 7472 | 6561 | 6d62 | 6173 | 6546 | 6920 |
| 3240760 | 636c | 6f73 | 655f | 5f31 | 3166 | 7374 | 7265 | 616d | 6261 | 7365 | 4676 | 2073 | 6574 | 6275 | 665f | 5f31 | 3166 | 7374 | 7265 | 616d | 6261 | 7365 | 4650 | 6369 |
| 3241040 | 2072 | 6462 | 7566 | 5f5f | 3131 | 6673 | 7472 | 6561 | 6d62 | 6173 | 6546 | 7620 | 7665 | 7269 | 6679 | 5f5f | 3131 | 6673 | 7472 | 6561 | 6d62 | 6173 | 6546 | 6920 |
| 3241120 | 3b3b | 3b00 | 7374 | 6174 | 655f | 7661 | 6c75 | 653a | 7428 | 302c | 3138 | 2900 | 4f62 | 6a65 | 6374 | 3a54 | 2830 | 2c37 | 3129 | 3d73 | 345f | 5f76 | 7074 | 725f |
| 3241200 | 5f36 | 4f62 | 6a65 | 6374 | 3a28 | 302c | 3330 | 292c | 302c | 3332 | 3b3b | 004f | 626a | 6563 | 743a | 5a63 | 4f62 | 6a65 | 6374 | 3b3b | 5f5f | 6374 | 5f5f | 364f |
| 3241260 | 626a | 6563 | 7446 | 7620 | 5f5f | 6374 | 5f5f | 364f | 626a | 6563 | 7446 | 5243 | 364f | 626a | 6563 | 7420 | 6572 | 726f | 724d | 656d | 6f72 | 795f | 5f36 | 4f62 |
| 3241340 | 6a65 | 6374 | 4650 | 6354 | 3120 | 6578 | 796c | 6169 | 6e5f | 5f36 | 4f62 | 6a65 | 6374 | 4650 | 6320 | 696e | 4f72 | 6465 | 725f | 5f36 | 4f62 | 6a65 | 6374 | 4650 |
| 3241420 | 364f | 626a | 6563 | 7420 | 3b3b | 3b00 | 5f5f | 7074 | 626c | 5f5f | 364f | 626a | 6563 | 745f | 5f4c | 6973 | 745f | 6462 | 5f63 | 7878 | 3a47 | 2830 | 2c33 | 3029 |
| 3241500 | 0050 | 463a | 7428 | 302c | 3135 | 2900 | 5046 | 433a | 7428 | 302c | 3135 | 2900 | 5046 | 493a | 7428 | 302c | 3135 | 2900 | 4e4f | 626a | 6563 | 743a | 5428 | 302c |
| 3241560 | 3732 | 293d | 7338 | 5f5f | 7670 | 7472 | 5f5f | 364f | 626a | 6563 | 743a | 2830 | 2c33 | 3029 | 2c30 | 2c33 | 323b | 6e61 | 6d65 | 5f5f | 374e | 4f62 | 6a65 | 6374 |
| 3241640 | 3a28 | 302c | 3331 | 292c | 3332 | 2c33 | 323b | 3b00 | 4e4f | 626a | 6563 | 743a | 5a63 | 4e4f | 626a | 6563 | 743b | 4f62 | 6a65 | 6374 | 3b5f | 5f63 | 745f | 5f37 |
| 3241720 | 4e4f | 626a | 6563 | 7446 | 5063 | 205f | 5f63 | 745f | 5f37 | 4e4f | 626a | 6563 | 7446 | 5243 | 374e | 4f62 | 6a65 | 6374 | 2073 | 6574 | 4e61 | 6d65 | 5f5f | 374e |
| 3242000 | 4f62 | 6a65 | 6374 | 4650 | 6320 | 6765 | 744e | 616d | 655f | 5f37 | 4e4f | 626a | 6563 | 7446 | 7620 | 6578 | 706c | 6169 | 6e5f | 5f37 | 4e4f | 626a | 6563 | 7446 |
| 3242060 | 5063 | 2067 | 6574 | 4174 | 7472 | 5f5f | 374e | 4f62 | 6a65 | 6374 | 4669 | 2067 | 6574 | 5072 | 6f70 | 5f5f | 374e | 4f62 | 6a65 | 6374 | 4650 | 6369 | 2073 | 6574 |
| 3242140 | 5072 | 6f70 | 5f5f | 374e | 4f62 | 6a65 | 6374 | 4650 | 6354 | 3120 | 5c00 | 7365 | 7450 | 726f | 705f | 5f37 | 4e4f | 626a | 6563 | 7446 | 5063 | 6920 | 7365 | 7450 |
| 3242220 | 726f | 705f | 5f37 | 4e4f | 626a | 6563 | 7446 | 5063 | 6620 | 6973 | 4754 | 455f | 5f37 | 4e4f | 626a | 6563 | 7446 | 5036 | 4f62 | 6a65 | 6374 | 2069 | 734c | 5445 |
| 3242300 | 5f5f | 374e | 4f62 | 6a65 | 6374 | 4650 | 364f | 626a | 6563 | 7420 | 3b3b | 3b00 | 6f73 | 7472 | 6561 | 6d5f | 7769 | 7468 | 6173 | 7369 | 676e | 3a54 | 2830 | 2c33 |
| 3242360 | 3729 | 3d73 | 3638 | 5f5f | 7670 | 7472 | 5f5f | 376f | 7374 | 7265 | 616d | 3a28 | 302c | 3330 | 292c | 302c | 3332 | 3b50 | 696f | 733a | 2830 | 2c33 | 3329 | 2c33 |
| 3242440 | 322c | 3332 | 3b4f | 696f | 733a | 2830 | 2c32 | 3329 | 2c36 | 342c | 3438 | 303b | 3b00 | 6f73 | 7472 | 6561 | 6d5f | 7769 | 7468 | 6173 | 7369 | 676e | 3a5a | 636f |
| 3242520 | 7374 | 7265 | 616d | 5f77 | 6974 | 6861 | 7373 | 6967 | 6e3b | 6f73 | 7472 | 6561 | 6d20 | 696f | 733b | 5f5f | 6374 | 5f5f | 3138 | 6f73 | 7472 | 6561 | 6d5f | 7769 |
| 3242600 | 7468 | 6173 | 7369 | 676e | 4676 | 205f | 5f63 | 745f | 5f31 | 386f | 7374 | 7265 | 616d | 5f77 | 6974 | 6861 | 7373 | 6967 | 6e46 | 5231 | 386f | 7374 | 7265 | 616d |
| 3242660 | 5f77 | 6974 | 6861 | 7373 | 6967 | 6e20 | 5f5f | 6474 | 5f5f | 3138 | 6f73 | 7472 | 6561 | 6d5f | 7769 | 7468 | 6173 | 7369 | 676e | 4676 | 205f | 5f61 | 735f | 5f31 |
| 3242740 | 386f | 7374 | 7265 | 616d | 5f77 | 6974 | 6861 | 7373 | 6967 | 6e46 | 5237 | 6f73 | 7472 | 6561 | 6d20 | 5c00 | 5f5f | 6173 | 5f5f | 3138 | 6f73 | 7472 | 6561 | 6d5f |
| 3243020 | 7769 | 7468 | 6173 | 7369 | 676e | 4650 | 3973 | 7472 | 6561 | 6d62 | 7566 | 203b | 3b3b | 0050 | 4642 | 3a74 | 2830 | 2c31 | 3529 | 004c | 4e4f | 626a | 6563 | 743a |
| 3243100 | 5428 | 302c | 3733 | 293d | 7331 | 325f | 5f76 | 7074 | 725f | 5f36 | 4f62 | 6a65 | 6374 | 3a28 | 302c | 3330 | 292c | 302c | 3332 | 3b6e | 616d | 655f | 5f37 | 4e4f |
| 3243160 | 626a | 6563 | 743a | 2830 | 2c33 | 3129 | 2c33 | 322c | 3332 | 3b6e | 6578 | 745f | 5f38 | 4c4e | 4f62 | 6a65 | 6374 | 3a28 | 302c | 3734 | 293d | 2a28 | 302c | 3733 |
| 3243240 | 292c | 3634 | 2c33 | 323b | 3b00 | 4c4e | 4f62 | 6a65 | 6374 | 3a5a | 634c | 4e4f | 626a | 6563 | 743b | 4e4f | 626a | 6563 | 743b | 5f5f | 6374 | 5f5f | 384c | 4e4f |
| 3243320 | 626a | 6563 | 7446 | 5063 | 5038 | 4c4e | 4f62 | 6a65 | 6374 | 205f | 5f63 | 745f | 5f38 | 4c4e | 4f62 | 6a65 | 6374 | 4652 | 4338 | 4c4e | 4f62 | 6a65 | 6374 | 2073 |
| 3243400 | 6574 | 4e65 | 7874 | 5f5f | 384c | 4e4f | 626a | 6563 | 7446 | 5038 | 4c4e | 4f62 | 6a65 | 6374 | 2067 | 6574 | 4e65 | 7874 | 5f5f | 384c | 4e4f | 626a | 6563 | 7446 |
| 3243460 | 7620 | 3b3b | 3b00 | 4c4f | 626a | 6563 | 743a | 5428 | 302c | 3735 | 293d | 7338 | 5f5f | 7670 | 7472 | 5f5f | 364f | 626a | 6563 | 743a | 2830 | 2c33 | 3029 | 2c30 |
| 3243540 | 2c33 | 323b | 6e65 | 7874 | 5f5f | 374c | 4f62 | 6a65 | 6374 | 3a28 | 302c | 3736 | 293d | 2a28 | 302c | 3735 | 292c | 3332 | 2c33 | 323b | 3b00 | 4c4f | 626a | 6563 |
| 3243620 | 743a | 5a63 | 4c4f | 626a | 6563 | 743b | 4f62 | 6a65 | 6374 | 3b5f | 5f63 | 745f | 5f37 | 4c4f | 626a | 6563 | 7446 | 5037 | 4c4f | 626a | 6563 | 7420 | 5f5f | 6374 |
| 3243700 | 5f5f | 374c | 4f62 | 6a65 | 6374 | 4652 | 4337 | 4c4f | 626a | 6563 | 7420 | 7365 | 744e | 6578 | 745f | 5f37 | 4c4f | 626a | 6563 | 7446 | 5037 | 4c4f | 626a | 6563 |
| 3243760 | 7420 | 6765 | 744e | 6578 | 745f | 5f37 | 4c4f | 626a | 6563 | 7446 | 7620 | 3b3b | 3b00 | 4c50 | 4f62 | 6a65 | 6374 | 3a54 | 2830 | 2c37 | 3729 | 3d73 | 3132 | 5f5f |
| 3244040 | 7670 | 7472 | 5f5f | 364f | 626a | 6563 | 743a | 2830 | 2c33 | 3029 | 2c30 | 2c33 | 323b | 6e65 | 7874 | 5f5f | 374c | 4f62 | 6a65 | 6374 | 3a28 | 302c | 3736 | 292c |
| 3244120 | 3332 | 2c33 | 323b | 6e6f | 626a | 7074 | 725f | 5f38 | 4c50, | 4f62 | 6a65 | 6374 | 3a28 | 302c | 3738 | 293d | 2a28 | 302c | 3732 | 292c | 3634 | 2c33 | 323b | 3b00 |
| 3244200 | 4c50 | 4f62 | 6a65 | 6374 | 3a5a | 634c | 504f | 626a | 6563 | 743b | 4c4f | 626a | 6563 | 743b | 5f5f | 6374 | 5f5f | 384c | 504f | 626a | 6563 | 7446 | 5037 | 4e4f |
| 3244260 | 626a | 6563 | 7450 | 374c | 4f62 | 6a65 | 6374 | 205f | 5f63 | 745f | 5f38 | 4c50 | 4f62 | 6a65 | 6374 | 4652 | 4338 | 4c50 | 4f62 | 6a65 | 6374 | 2073 | 6574 | 4f62 |
| 3244340 | 6a65 | 6374 | 5f5f | 344c | 504f | 626a | 6563 | 7446 | 5037 | 4e4f | 626a | 6563 | 7420 | 6765 | 744f | 626a | 6563 | 745f | 5f38 | 4c50 | 4f62 | 6a65 | 6374 | 4676 |
| 3244420 | 2065 | 7870 | 6c61 | 696e | 5f5f | 384c | 504f | 626a | 6563 | 7446 | 5063 | 203b | 3b3b | 005f | 5f70 | 7462 | 6c5f | 5f38 | 4c50 | 4f62 | 6a65 | 6374 | 5f5f | 4c69 |
| 3244500 | 7374 | 5f64 | 625f | 6378 | 783a | 4728 | 302c | 3330 | 2900 | 4c69 | 7374 | 3a54 | 2d30 | 2c37 | 3929 | 3d73 | 3132 | 636f | 756e | 745f | 5f34 | 4c69 | 7374 | 3a28 |
| 3244560 | 302c | 3129 | 2c30 | 2c33 | 323b | 7074 | 724c | 4f62 | 6a65 | 6374 | 5f5f | 344c | 6973 | 743a | 2830 | 2c37 | 3629 | 2c33 | 322c | 3332 | 3b5f | 5f76 | 7074 | 725f |
| 3244640 | 5f34 | 4c69 | 7374 | 3a28 | 302c | 3330 | 292c | 3634 | 2c33 | 323b | 3b00 | 4c69 | 7374 | 3a5a | 634c | 6973 | 743b | 3b5f | 5f63 | 745f | 5f34 | 4c69 | 7374 | 4676 |
| 3244720 | 205f | 5f63 | 745f | 5f34 | 4c69 | 7374 | 4652 | 4334 | 4c69 | 7374 | 205f | 5f64 | 745f | 5f34 | 4c69 | 7374 | 4676 | 2067 | 6574 | 436f | 756e | 745f | 5f34 | 4c69 |
| 3245000 | 7374 | 4676 | 2067 | 6574 | 546f | 705f | 5f34 | 4c69 | 7374 | 4676 | 2073 | 6574 | 546f | 705f | 5f34 | 4c69 | 7374 | 4650 | 374c | 4f62 | 6a65 | 6374 | 2065 | 7272 |
| 3245060 | 6f72 | 4d65 | 6d6f | 7279 | 5f5f | 344c | 6973 | 7446 | 5063 | 5431 | 2062 | 726f | 6164 | 6361 | 7374 | 5f5f | 344c | 6973 | 7446 | 4d36 | 4f62 | 6a65 | 6374 | 4676 |
| 3245140 | 5f76 | 2065 | 7870 | 6c61 | 696e | 5f5f | 344c | 6973 | 7446 | 5063 | 205c | 0069 | 6e73 | 6572 | 745f | 5f34 | 4c69 | 7374 | 4650 | 374c | 4f62 | 6a65 | 6374 | 2069 |
| 3245220 | 734d | 656d | 6265 | 725f | 5f34 | 4c69 | 7374 | 4650 | 374c | 4f62 | 6a65 | 6374 | 2069 | 734d | 656d | 6265 | 725f | 5f34 | 4c69 | 7374 | 4650 | 6320 | 6973 | 4571 |
| 3245300 | 7561 | 6c5f | 5f34 | 4c69 | 7374 | 4652 | 344c | 6973 | 7420 | 7265 | 6d6f | 7665 | 5f5f | 344c | 6973 | 7446 | 5063 | 203b | 3b3b | 005f | 5f70 | 7462 | 6c5f | 5f34 |

| | | | | | | | | | | | | | | | | | | | | | | | | |
|---|---|---|---|---|---|---|---|---|---|---|---|---|---|---|---|---|---|---|---|---|---|---|---|---|
| 3245360 | 4c69 | 7374 | 5f5f | 4c69 | 7374 | 5f64 | 625f | 6378 | 783a | 4728 | 302c | 3330 | 2900 | 5f5f | 6474 | 5f5f | 344c | 6973 | 7446 | 763a | 4628 | 302c | 3229 | 005f |
| 3245440 | 5f30 | 7468 | 6973 | 3a70 | 2830 | 2c38 | 3029 | 3d2a | 2930 | 2c37 | 3929 | 005f | 5f30 | 5f5f | 6672 | 6565 | 3a70 | 2830 | 2c31 | 2900 | 2e2f | 6878 | 782f | 4c69 |
| 3245520 | 7374 | 5f64 | 622e | 6878 | 7800 | 5f5f | 3168 | 6561 | 643a | 2830 | 2c37 | 3629 | 005f | 5f30 | 7468 | 6973 | 203a | 5a74 | 6c00 | 4c69 | 7374 | 5f64 | 622e | 6378 |
| 3245600 | 7800 | 5f5f | 3168 | 6561 | 6420 | 3a5a | 746c | 005f | 5f30 | 5f5f | 6672 | 6565 | 203a | 5a74 | 6c00 | 5f5f | 326e | 6578 | 743a | 2830 | 2c37 | 3629 | 005f | 5f32 |
| 3245660 | 6e65 | 7874 | 203a | 5a74 | 6c00 | 5f5f | 6474 | 5f5f | 344c | 6973 | 7446 | 7620 | 3a5a | 7446 | 0069 | 6e73 | 6572 | 745f | 5f34 | 4c69 | 7374 | 4550 | 374c | 4f62 |
| 3245740 | 6a65 | 6374 | 3a46 | 2830 | 2c32 | 2900 | 5f5f | 3074 | 6869 | 733a | 7028 | 302c | 3830 | 2900 | 5f5f | 306e | 3a70 | 2830 | 2c37 | 3629 | 005f | 5f30 | 7468 | 6973 |
| 3246020 | 3a72 | 2930 | 2c38 | 3029 | 005f | 5f30 | 5f5f | 5874 | 6869 | 7330 | 3061 | 7562 | 7862 | 703a | 2830 | 2c37 | 3629 | 005f | 5f30 | 5f5f | 586f | 3030 | 6175 | 6278 |
| 3246100 | 6270 | 3a28 | 302c | 3736 | 2900 | 5f5f | 3074 | 6869 | 7320 | 3a5a | 746c | 005f | 5f30 | 6e20 | 3a5a | 746c | 005f | 5f30 | 5f5f | 5874 | 6869 | 7330 | 3061 | 7562 |
| 3246160 | 7862 | 7020 | 3a5a | 746c | 005f | 5f30 | 5f5f | 586f | 3030 | 6175 | 6278 | 6270 | 203a | 5a74 | 6c00 | 696e | 7365 | 7274 | 5f5f | 344c | 6973 | 7446 | 5037 | 4c4f |
| 3246240 | 626a | 6563 | 7420 | 3a5a | 7446 | 0065 | 7272 | 6f72 | 4d65 | 6d6f | 7279 | 5f5f | 344c | 6973 | 7446 | 5063 | 5431 | 3a46 | 2830 | 2c32 | 2900 | 5f5f | 3074 | 6869 |
| 3246320 | 733a | 7028 | 302c | 3930 | 2900 | 5f5f | 3073 | 313a | 7028 | 302c | 3331 | 2900 | 5f5f | 3073 | 323a | 7028 | 302c | 3331 | 2900 | 5f5f | 3074 | 6869 | 7320 | 3a5a |
| 3246400 | 746c | 005f | 5f30 | 7331 | 203a | 5a74 | 6c00 | 5f5f | 3073 | 3220 | 3a5a | 746c | 0065 | 7272 | 6f72 | 4d65 | 6d6f | 7279 | 5f5f | 344c | 6973 | 7446 | 5063 | 5431 |
| 3246460 | 203a | 5a74 | 4600 | 6272 | 6f61 | 6463 | 6173 | 745f | 5f34 | 4c69 | 7374 | 464d | 364f | 626a | 6563 | 7446 | 765f | 763a | 4628 | 302c | 3229 | 005f | 5f30 | 7468 |
| 3246540 | 6973 | 3a70 | 2830 | 2c38 | 3029 | 005f | 5f30 | 6675 | 6e63 | 3a70 | 2830 | 2c31 | 3529 | 005f | 5f30 | 6675 | 6e63 | 3a72 | 2830 | 2c31 | 3529 | 005f | 5f31 | 6e3a |
| 3246620 | 2830 | 2c37 | 3629 | 005f | 5f30 | 7469 | 6973 | 203a | 5a74 | 6c00 | 5f5f | 3066 | 756e | 6320 | 3a5a | 746c | 005f | 5f31 | 6e20 | 3a5a | 746c | 0062 | 726f | 6164 |
| 3246700 | 6361 | 7374 | 5f5f | 344c | 6973 | 7446 | 4d36 | 4f62 | 6a65 | 6374 | 4676 | 5f76 | 203a | 5a74 | 4600 | 6578 | 706c | 6169 | 6e5f | 5f34 | 4c69 | 7374 | 4650 | 633a |
| 3246760 | 4628 | 302c | 3229 | 005f | 5f30 | 7469 | 6973 | 3a70 | 2830 | 2c38 | 3029 | 005f | 5f30 | 733a | 7028 | 302c | 3331 | 2900 | 5f5f | 3074 | 6869 | 733a | 7228 | 302c |
| 3247040 | 3830 | 2900 | 5f5f | 3074 | 6869 | 7320 | 3a5a | 746c | 005f | 5f30 | 7320 | 3a5a | 746c | 005f | 5f32 | 6e3a | 2830 | 2c37 | 3629 | 005f | 5f32 | 6e20 | 3a5a | 746c |
| 3247120 | 0065 | 7870 | 6c61 | 696e | 5f5f | 344c | 6973 | 7446 | 5063 | 203a | 5a74 | 4600 | 5f5f | 7374 | 695f | 5f4c | 6973 | 745f | 6462 | 5f63 | 7878 | 5f5f | 5f64 | 745f |
| 3247200 | 3a46 | 2830 | 2c32 | 2900 | 2f75 | 7372 | 2f43 | 432f | 7375 | 6e34 | 2f69 | 6e63 | 6c2f | 696f | 7374 | 7265 | 616d | 2e68 | 005f | 5f73 | 7464 | 5f5f | 4c69 | 7374 |
| 3247260 | 5f64 | 625f | 6378 | 785f | 5f5f | 6474 | 5f3a | 4628 | 302c | 3229 | 005f | 5f76 | 7462 | 6c5f | 5f34 | 4c69 | 7374 | 3a47 | 2830 | 2c38 | 3129 | 3d61 | 7228 | 302c |
| 3247340 | 3129 | 3b30 | 3b36 | 3b28 | 302c | 3135 | 2900 | 5f5f | 7674 | 626c | 5f5f | 384c | 504f | 626a | 6563 | 745f | 5f4c | 6973 | 745f | 6462 | 5f63 | 7878 | 3a47 | 2830 |
| 3247420 | 2c38 | 3229 | 3d61 | 7228 | 302c | 3129 | 3b30 | 3b33 | 3b29 | 302c | 3135 | 2900 | 7265 | 6d6f | 7665 | 5f5f | 344c | 6973 | 7446 | 5063 | 3a66 | 2830 | 2c31 | 2900 |
| 3247500 | 5f5f | 3074 | 6869 | 733a | 7028 | 302c | 3830 | 2900 | 5f5f | 305f | 5f41 | 3437 | 3a70 | 2830 | 2c33 | 3129 | 002e | 2f68 | 7378 | 2f4c | 6973 | 745f | 6462 | 2e68 |
| 3247560 | 7878 | 005f | 5f30 | 7468 | 6973 | 203a | 5a74 | 6c00 | 5f5f | 305f | 5f41 | 3437 | 203a | 5a74 | 6c00 | 7265 | 6d6f | 7665 | 5f5f | 344c | 6973 | 7446 | 5063 | 203a |
| 3247640 | 5a74 | 4600 | 6973 | 4571 | 7561 | 6c5f | 5f34 | 4c69 | 7374 | 4652 | 344c | 6973 | 743a | 6628 | 302c | 3129 | 005f | 5f30 | 7468 | 6973 | 3a70 | 2830 | 2c38 | 3029 |
| 3247720 | 005f | 5f30 | 5f5f | 4134 | 363a | 7028 | 302c | 3830 | 2900 | 5f5f | 3074 | 6869 | 7320 | 3a5a | 746c | 005f | 5f30 | 5f5f | 4134 | 3620 | 3a5a | 746c | 005f | 5f30 |
| 3250000 | 5f5f | 4134 | 3620 | 3a5a | 7200 | 6973 | 4571 | 7561 | 6c5f | 5f34 | 4c69 | 7374 | 4652 | 344c | 6973 | 7420 | 3a5a | 7446 | 0069 | 734d | 656d | 6265 | 725f | 5f34 |
| 3250060 | 4c69 | 7374 | 4650 | 633a | 6628 | 302c | 3738 | 2900 | 5f5f | 3074 | 6869 | 733a | 7028 | 302c | 3830 | 2900 | 5f5f | 305f | 5f41 | 3435 | 3a70 | 2830 | 2c33 | 3129 |
| 3250140 | 005f | 5f30 | 7468 | 6973 | 203a | 5a74 | 6c00 | 5f5f | 305f | 5f41 | 3435 | 203a | 5a74 | 6c00 | 6973 | 4d65 | 6d62 | 6572 | 5f5f | 344c | 6973 | 7446 | 5063 | 203a |
| 3250220 | 5a74 | 4600 | 6973 | 4d65 | 6d62 | 6572 | 5f5f | 344c | 6973 | 7446 | 5037 | 4c4f | 626a | 6563 | 743a | 6628 | 302c | 3736 | 2900 | 5f5f | 3074 | 6869 | 733a | 7028 |
| 3250300 | 302c | 3830 | 2900 | 5f5f | 305f | 5f41 | 3434 | 3a70 | 2830 | 2c37 | 3629 | 005f | 5f30 | 7468 | 6973 | 203a | 5a74 | 6c00 | 5f5f | 305f | 5f41 | 3434 | 203a | 5a74 |
| 3250360 | 6c00 | 6973 | 4d65 | 6162 | 6572 | 5f5f | 344c | 6973 | 7446 | 5037 | 4c4f | 626a | 6563 | 7420 | 3a5a | 7446 | 0065 | 7870 | 6c61 | 696e | 5f5f | 384c | 504f | 626a |
| 3250440 | 6563 | 7446 | 5063 | 3a66 | 2830 | 2c32 | 2900 | 5f5f | 3074 | 6869 | 733a | 7028 | 302c | 3833 | 293d | 2a28 | 302c | 3737 | 2900 | 5f5f | 3073 | 3a70 | 2830 | 2c33 |
| 3250520 | 3129 | 002f | 686f | 6d65 | 2f6f | 7361 | 7331 | 2f61 | 2f61 | 622f | 7372 | 632f | 6e65 | 776f | 626a | 6563 | 7473 | 2f68 | 7878 | 2f4c | 504f | 626a | 6563 | 745f |
| 3250600 | 6462 | 2e68 | 7878 | 005f | 5f30 | 7468 | 6973 | 3a72 | 2830 | 2c38 | 3329 | 005f | 5f30 | 7468 | 6973 | 203a | 5a74 | 6c00 | 5f5f | 3073 | 203a | 5a74 | 6c00 | 6578 |
| 3250660 | 706c | 6169 | 6e5f | 5f38 | 4c50 | 4f62 | 6a65 | 6374 | 4650 | 6320 | 3a5a | 7446 | 0069 | 6e4f | 7264 | 6572 | 5f5f | 364f | 626a | 6563 | 7446 | 5036 | 4f62 | 6a65 |
| 3250740 | 6374 | 3a66 | 2830 | 2c31 | 2900 | 5f5f | 3074 | 6869 | 733a | 7028 | 302c | 3834 | 293d | 2a28 | 302c | 3731 | 2900 | 5f5f | 305f | 5f41 | 3237 | 3a70 | 2830 | 2c38 |
| 3251020 | 3429 | 002f | 686f | 6d65 | 2f6f | 7361 | 7331 | 2f61 | 2f61 | 622f | 7372 | 632f | 6e65 | 776f | 626a | 6563 | 7473 | 2f68 | 7878 | 2f4f | 626a | 6563 | 745f | 6462 |
| 3251100 | 2e68 | 7878 | 005f | 5f30 | 7468 | 6973 | 203a | 5a74 | 6c00 | 5f5f | 305f | 5f41 | 3237 | 203a | 5a74 | 6c00 | 696e | 4f72 | 6465 | 725f | 5f36 | 4f62 | 6a65 | 6374 |
| 3251160 | 4650 | 364f | 626a | 6563 | 7420 | 3a5a | 7446 | 006c | 7369 | 696f | 2e6f | 005f | 6c69 | 6e65 | 636e | 7400 | 5f73 | 6176 | 6e65 | 746e | 616d | 6500 | 5f73 | 6176 |
| 3251240 | 6570 | 6167 | 656e | 6f00 | 5f69 | 6e5f | 6c73 | 6961 | 626f | 7274 | 005f | 7474 | 7970 | 7274 | 6573 | 756d | 005f | 6465 | 6c74 | 6162 | 7566 | 005f | 646f | 5f71 |
| 3251320 | 7565 | 7279 | 005f | 6f6e | 6162 | 6f72 | 7400 | 5f69 | 6e69 | 7466 | 6c61 | 6700 | 5f74 | 7261 | 696c | 6572 | 005f | 636f | 756e | 7400 | 5f6e | 6d73 | 6700 | 5f6c |
| 3251400 | 7369 | 7472 | 6c69 | 6400 | 5f6c | 5962 | 6465 | 6669 | 6400 | 5f6c | 7369 | 6c73 | 7469 | 6400 | 5f6c | 7369 | 6465 | 6669 | 6400 | 5f6c | 7369 | 7379 | 7369 | 6400 |
| 3251460 | 5f6c | 7374 | 666e | 616d | 6500 | 5f6c | 696e | 6563 | 6e74 | 6c00 | 5f6c | 6f6f | 6b63 | 6861 | 7200 | 5f77 | 616e | 7473 | 746f | 005f | 6d65 | 6467 | 726f | 7570 |
| 3251540 | 005f | 7072 | 696e | 7470 | 7267 | 7665 | 7273 | 696f | 6e00 | 5f64 | 6f5f | 6f70 | 7474 | 726c | 005f | 656e | 7465 | 7266 | 756e | 6300 | 5f70 | 6167 | 6573 | 697a |
| 3251620 | 6500 | 5f72 | 6561 | 645f | 626c | 6600 | 5f73 | 686f | 7274 | 6c73 | 7400 | 5f6d | 615f | 6964 | 005f | 7461 | 6273 | 746f | 7073 | 005f | 6572 | 7262 | 7566 | 005f |
| 3251700 | 7068 | 6561 | 6400 | 5f61 | 736b | 5f62 | 726f | 7773 | 6500 | 5f6c | 7369 | 6770 | 616c | 6964 | 005f | 7263 | 7369 | 6400 | 5f68 | 6561 | 6465 | 7200 | 5f73 | 6c62 |
| 3251760 | 7566 | 005f | 736c | 7374 | 7200 | 5f62 | 6c66 | 005f | 696e | 6669 | 6c65 | 005f | 7469 | 746c | 6500 | 5f70 | 7269 | 6e74 | 5f6d | 7367 | 005f | 786f | 6e61 | 626f |
| 3252040 | 7274 | 6c69 | 7374 | 005f | 7072 | 746c | 6f6e | 6773 | 7472 | 696e | 6700 | 5f63 | 6863 | 6f75 | 6e74 | 005f | 646f | 5f65 | 7869 | 7400 | 5f70 | 6167 | 656e | 6f00 |
| 3252120 | 5f6d | 696e | 5f62 | 726f | 7773 | 6500 | 5f68 | 6561 | 6465 | 7231 | 005f | 6865 | 6164 | 6572 | 3200 | 5f70 | 7267 | 7665 | 7273 | 696f | 6e00 | 5f77 | 7269 | 7465 |
| 3252200 | 6c73 | 7466 | 6e61 | 6d65 | 005f | 6461 | 7465 | 005f | 5765 | 6e6c | 7374 | 666e | 616d | 6500 | 2f68 | 6f6d | 652f | 5f73 | 6173 | 322f | 622f | 6465 | 762f | 4c49 |
| 3252260 | 4253 | 2f72 | 656c | 3130 | 2f4c | 5349 | 2f73 | 756e | 342f | 006c | 7369 | 696f | 2e63 | 0069 | 6e74 | 3a74 | 2830 | 2c31 | 293d | 7228 | 302c | 3129 | 3b2d | 3231 |
| 3252340 | 3437 | 3438 | 3336 | 3438 | 3b32 | 3134 | 3734 | 3833 | 3634 | 373b | 0063 | 6861 | 723a | 7428 | 302c | 3229 | 3d72 | 2830 | 2c32 | 293b | 303b | 3132 | 373b | 006c |
| 3252420 | 6f6e | 673a | 7428 | 302c | 3329 | 3d72 | 2830 | 2c31 | 293b | 2d32 | 3134 | 3734 | 3833 | 3634 | 383b | 3231 | 3437 | 3438 | 3336 | 3437 | 3b00 | 7368 | 6f72 | 743a |

```
3252500  7428 302c 3429 3d72 2830 2c31 293b 2d33 3237 3638 3b33 3237 3637 3b00 756e 7369 676e 6564 2063 6961 723a 7428 302c 3529
3252560  3172 2830 2c31 293b 303b 3235 353b 0075 6e73 6967 6e65 6420 7368 6f72 743a 7428 302c 3629 3d72 2830 2c31 293b 303b 3635
3252640  3533 353b 0075 6e73 6967 6e65 6420 6c6f 6e67 3a74 2830 2c37 293d 7228 302c 3129 3b30 3b2d 313b 0075 6e73 6967 6e65 6420
3252720  695e 743a 7428 302c 3829 3d72 2830 2c31 293b 303b 2431 3b00 666c 6f61 743a 7428 302c 3929 3172 2830 2c31 293b 343b 303b
3253000  0064 6f75 626c 653a 7428 302c 3130 293d 7228 302c 3129 3b38 3b30 3b00 766f 6964 3a74 2830 2c31 3129 3d28 302c 3131 2900
3253060  3f3f 3f3a 7428 332c 3132 293d 2830 2c31 2900 7263 7369 643a 5328 302c 3133 293d 6172 2830 2c31 293b 303b 3539 3b28 302c
3253140  3229 002f 7573 722f 696e 636c 7564 652f 7374 6469 6f2e 6800 2f75 7372 2f69 6e63 6c75 6465 2f76 6172 6172 6773 2e68 0076
3253220  615f 6c69 7374 3a74 2832 2c31 293d 2a28 302c 3229 002e 2f6c 7369 7379 732e 6800 2e2f 6c73 6973 7973 2e68 006c 7369 7379
3253300  7369 643a 5328 332c 3129 3d61 7228 302c 3129 3b30 3b36 313b 2830 2c32 2900 6669 6c65 696e 666f 3a54 2833 2c32 293d 7331
3253360  3675 6e69 7175 655f 6964 3a28 322c 3129 2c30 2c33 323b 666e 616d 653a 2832 2c31 292c 3332 2c33 323b 7265 765f 6461 7465
3253440  3a28 322c 3129 2c36 342c 3332 3b74 6f74 616c 5f62 7974 6573 3a28 302c 3129 2c39 362c 3332 3b3b 0046 494c 4549 4e46 4f3a
3253520  7428 332c 3229 002e 2f6c 7369 6465 662e 6800 2e2f 6c73 6964 6566 2e68 006c 7369 6465 6669 643a 5328 342c 3129 3d61 7228
3253600  302c 3129 3b30 3b36 303b 2830 2c32 2900 2e2f 6c73 696c 7374 2e68 002e 2f6c 7369 6c73 742e 6800 6c73 696c 7374 6964 3a53
3253660  2835 2c31 293d 6172 2830 2c31 293b 303b 3632 3b28 302c 3229 002e 2f6c 7369 6770 616c 2e68 002e 2f6c 7369 6770 616c 2e68
3253740  006c 7369 6770 616c 6964 3a53 2935 2c31 2900 2f75 7372 2f6c 7369 2f64 6576 2f74 6f6f 6c6c 6962 2f69 6e63 6c75 6465 2f6d
3254020  612e 6800 2f75 7372 2f6c 7369 2f64 6576 2f74 6f6f 6c6c 6962 2f69 6e63 6c75 6465 2f6d 612e 6800 6461 5f69 643a 5328 302c
3254100  3133 2900 706f 696e 7465 723a 7428 372c 3129 312a 2837 2c32 293d 6172 2830 2c31 293b 303b 303b 2837 2c33 293d 6172 2830
3254160  2c31 293b 303b 303b 2837 2c34 293d 6172 2830 2c31 293b 303b 303b 2837 2c35 293d 6172 2830 2c31 293b 303b 303b 2837 2c36
3254240  293d 6172 2830 2c31 293b 303b 303b 2837 2c37 293d 6172 2830 2c31 293b 303b 303b 2830 2c32 2900 626f 6f6c 6561 6e3a 7428
3254320  302c 3129 006d 615f 6772 6f75 703a 7428 372c 3829 3d2a 2837 2c39 293d 7334 6d61 5f67 726f 7570 3a28 302c 3129 2c30 2c33
3254400  323b 3b00 6675 6e63 7469 6f6e 3a74 2837 2c31 3029 3d2a 2837 2c31 3129 3d66 2830 2c31 2900 6d65 6d5f 616c 6c6f 6361 7465
3254460  643a 4728 302c 3129 006d 656d 5f75 7365 643a 4728 302c 3129 006f 7574 5f6f 665f 6d65 6d6f 7279 5f66 756e 6374 696f 6e3a
3254540  4728 372c 3130 2900 2e2f 6c69 6264 6566 2e68 002e 2f6c 6962 6465 662e 6800 6c69 6264 6566 6964 3a53 2835 2c31 2900 7573
3254620  6572 6c69 623a 5428 382c 3129 3173 3478 5f6c 6962 7261 7279 3a28 302c 3129 2c30 2c33 323b 3b00 4c49 4252 4152 593a 7428
3254700  382c 3129 0075 7365 726d 656d 623a 5428 382c 3229 3d73 3478 5f6d 656d 6265 723a 2830 2c31 292c 302c 3332 3b3b 004d 454d
3254760  4245 523a 7428 382c 3229 0075 7365 726c 656e 743a 5428 382c 3329 3d73 386d 6e61 6d65 3a28 322c 3129 2c30 2c33 323b 6d73
3255040  697a 653a 2830 2c31 292c 3332 2c33 323b 3b00 4c49 424e 414d 3a74 2838 2c33 2900 7573 6572 6d69 6e66 6f3a 5428 382c 3429
3255120  3173 3230 6c70 3a28 382c 3529 312a 2838 2c31 292c 302c 3332 3b6c 6e61 6d65 3a28 322c 3129 2c33 322c 3332 3b6d 6e61 6d65
3255200  3a28 322c 3129 2c36 342c 3332 3b6d 7369 7a65 3a28 302c 3129 2c39 362c 3332 3b72 7761 3a28 302c 3229 2c31 3238 2c38 3b70
3255260  6164 313a 2830 2c32 292c 3133 362c 383b 7061 6432 3a28 302c 3229 2c31 3434 2c38 3b70 6164 333a 2830 2c32 292c 3135 322c
3255340  383b 3b00 4d45 4d42 494e 464f 3a74 2838 2c34 2900 6c69 6274 726f 6e3a 4728 302c 3129 006c 6962 7265 6173 6f6e 3a47 2830
3255420  2c31 2900 6c69 6263 7279 7074 3a47 2830 2c31 2900 6c69 6263 6f6d 7061 743a 4728 302c 3129 002e 2f6c 7369 7472 6c2e 6800
3255500  2e2f 6c73 6974 726c 2e68 006c 7369 7472 6c69 643a 5328 392c 3129 3d61 7228 302c 3129 3b30 3b36 343b 2830 2c32 2900 666e
3255560  616d 655f 7374 7275 6374 3a54 2839 2c32 293d 7331 3266 703a 2839 2c33 293d 2a28 312c 3129 2c30 2c33 323b 666e 616d 653a
3255640  2832 2c31 292c 3332 2c33 323b 6368 6169 6e3a 2839 2c34 293d 2a28 392c 3229 2c36 342c 3332 3b3b 0046 4e41 4d45 5f53 5452
3255720  5543 543a 7428 392c 3229 0074 7261 696c 5f73 7472 7563 743a 5428 392c 3529 3d73 3136 6865 6164 3a28 392c 3729 3d2a 2839
3256000  2c36 293d 7873 7472 6169 6c5f 6865 6164 3a2c 302c 3332 3b67 726f 7570 3a28 372c 3829 2c33 322c 3332 3b66 696c 655f 6c69
3256060  7374 3a28 392c 3429 2c36 342c 3332 3b73 6f75 7263 655f 7074 723a 2832 2c31 292c 3936 2c33 323b 3b00 5452 4149 4c5f 5354
3256140  5255 4354 3a74 2839 2c35 2900 7472 6169 6c5f 6865 6164 3a54 2839 2c36 293d 7332 3470 726f 676e 616d 653a 2832 2c31 292c
3256220  302c 3332 3b76 6572 7369 5f6e 3a28 322c 3129 2c33 322c 3332 3b63 7572 725f 7469 6d65 3a28 322c 3129 2c36 342c 3332 3b6f
3256300  7074 696f 6e73 3a28 392c 3131 293d 2a28 392c 3929 3d78 736f 7074 696f 6e5f 6c69 7374 3a2c 3936 2c33 323b 6669 6c65 733a
3256360  2839 2c31 3229 312a 2839 2c39 293d 7873 6669 6c65 5f6c 6973 743a 2c31 3238 2c33 323b 6c69 6273 3a28 392c 3133 293d 2a28
3256440  392c 3130 293d 7873 6c69 625f 6c69 7374 3a2c 3136 302c 3332 3b3b 0054 5241 494c 5f48 4541 443a 7428 392c 3629 006f 7074
3256520  696f 6e5f 6c69 7374 3a54 2839 2c38 293d 7332 3467 726f 7570 3a28 322c 3129 2c30 2c33 323b 6e61 6d65 3a28 322c 3129 2c33
3256600  322c 3332 3b76 616c 7565 3a28 322c 3129 2c36 342c 3332 3b75 6e69 743a 2832 2c31 292c 3936 2c33 323b 7065 726d 666c 6167
3256660  3a28 302c 3229 2c31 3238 2c39 3b70 6164 3a28 392c 3134 293d 6172 2830 2c31 293b 303b 323b 2830 2c32 292c 3133 362c 3234
3256740  3b63 6861 696e 3a28 392c 3135 293d 2a28 392c 3829 2c31 3630 2c33 323b 3b00 4f50 5449 4f4e 5f4c 4953 543a 7428 392c 3829
3257020  0066 696c 655f 6c69 7374 3a54 2839 2c39 293d 7333 326e 616d 653a 2832 2c31 292c 302c 3332 3b66 6e61 6d65 3a28 322c 3129
3257100  2c33 322c 3332 3b63 686b 7375 6d3a 2832 2c31 292c 3634 2c33 323b 7265 765f 6461 7465 3a28 322c 3129 2c39 362c 3332 3b72
3257160  773a 2830 2c32 292c 3132 382c 383b 7061 643a 2839 2c31 3429 2c31 3336 2c32 343b 6869 7374 3a28 392c 3136 293d 2a28 392c
3257240  3629 2c31 3630 2c33 323b 7265 663a 2839 2c31 3629 2c31 3932 2c33 323b 6368 6169 6e3a 2839 2c31 3729 3d2a 2839 2c39 292c
3257320  3232 342c 3332 3b3b 0046 494c 455f 4c49 5354 3a74 2839 2c39 2900 6c69 625f 6c69 7374 3a54 2839 2c31 3029 3d73 3230 6e61
3257400  6365 3a28 322c 3129 2c30 2c33 323b 666e 6161 653a 2832 2c31 292c 3332 2c33 323b 755e 6971 7565 5f69 643a 2832 2c31 292c
3257460  3634 2c33 323b 6d65 6d62 733a 2939 2c31 3929 312a 2839 2c31 3829 3d78 736d 656d 625f 6c69 7374 3a2c 3936 2c33 323b 6368
3257540  6169 6e3a 2839 2c32 3029 3d2a 2339 2c31 3029 2c31 3238 2c33 323b 3b00 4c49 425f 4c49 5354 3a74 2839 2c31 3029 006d 656d
```

```
3257620 625f 6c69 7374 3a54 2839 2c31 3829 3d73 3332 6e61 6d65 3a28 322c 3129 2c30 2c33 323b 7265 765f 6461 7465 3a28 322c 3129
3257700 2c33 322c 3332 3b72 773a 2830 2c32 292c 3634 2c38 3b70 6164 313a 2839 2c31 3429 2c37 322c 3234 3b68 6973 743a 2839 2c31
3257760 3629 2c39 362c 3332 3b72 6566 3a28 392c 3136 292c 3132 382c 3332 3b70 6572 6d66 6c61 673a 2830 2c32 292c 3136 302c 383b
3260040 7061 6432 3a28 392c 3134 292c 3136 382c 3234 3b5c 006d 703a 2839 2c32 3129 3d2a 2838 2c32 292c 3139 322c 3332 3b63 6861
3260120 696e 3a28 392c 3232 293d 2a28 392c 3138 292c 3232 342c 3332 3b3b 004d 454d 425f 4c49 5354 3a74 2839 2c31 3829 0070 6172
3260200 7365 5f73 7472 7563 743a 5428 392c 3233 293d 7338 6865 6164 3a28 322c 3129 2c30 2c33 323b 7461 696c 3a28 322c 3129 2c33
3260260 322c 3332 3b3b 0050 4152 5345 5f53 5452 5543 543a 7428 392c 3233 2900 7472 696d 5f73 7472 7563 743a 5428 392c 3234 293d
3260340 7331 3668 6561 643a 2839 2c31 3629 2c30 2c33 323b 7265 663a 2839 2c32 3529 3d2a 2839 2c31 3629 2c33 322c 3332 3b64 6570
3260420 7468 3a28 302c 3429 2c36 342c 3136 3b6d 6172 6b3a 2830 2c34 292c 3830 2c31 363b 6368 6169 6e3a 2839 2c32 3629 3d2a 2839
3260500 2c32 3429 2c39 362c 3332 3b3b 0054 5249 4d5f 5354 5255 4354 3a74 2839 2c32 3429 0061 7564 6974 5f74 7261 696c 3a47 2830
3260560 2c31 3429 3d2a 2839 2c35 2900 6c73 6969 6f2e 6300 6669 6c65 6e61 6d65 3a47 2832 2c31 2900 696e 5f6c 7369 6162 6f72 743a
3260640 5328 302c 3129 0069 6e64 6973 703a 4728 302c 3229 0070 6167 656e 756d 3a47 2830 2c34 2900 6470 7061 6765 3a47 2830 2c34
3260720 2900 6c69 7374 3a47 2830 2c32 2900 7761 726e 3a47 2830 2c32 2900 6572 7273 3a47 2830 2c32 2900 7365 7272 733a 4728 302c
3261000 3229 0073 7461 7473 3a47 2830 2c32 2900 6c69 6e65 7463 6e74 3a47 2830 2c31 2900 6c69 6e65 696e 6372 3a47 2830 2c31 2900
3261060 7061 6765 666c 6167 3a47 2830 2c32 2900 6c69 6e65 666c 6167 3a47 2830 2c32 2900 6461 7465 3a53 2832 2c31 2900 6865 6164
3261140 6572 313a 5328 302c 3135 293d 6172 2830 2c31 293b 303b 3133 323b 2830 2c32 2900 6865 6164 6572 323a 5328 302c 3135 2900
3261220 6865 6164 6572 3a53 2830 2c31 3529 0074 6974 6c65 3a53 2830 2c31 3529 0073 6176 6e65 746e 616d 653a 5328 322c 3129 0074
3261300 7261 696c 6572 3a53 2830 2c31 3529 006c 696e 6563 6e74 3a53 2830 2c31 2900 696e 6974 666c 6167 3a53 2830 2c31 2900 7061
3261360 6765 6e6f 3a53 2830 2c31 2900 7361 7665 7061 6765 6e6f 3a53 2830 2c31 2900 7061 6765 7369 7a65 3a53 2830 2c31 2900 6c6f
3261440 6f6b 6368 6172 3a53 2830 2c31 2900 6e6d 7367 3a53 2830 2c31 2900 6368 636f 756e 743a 5328 302c 3129 0065 7272 6275 663a
3261520 5328 302c 3136 2931 6172 2830 2c31 293b 303b 3230 303b 2832 2c31 2900 696e 6669 6c65 3a53 2839 2c33 2900 6465 6c74 6162
3261600 7566 3a53 2830 2c31 3729 3d61 7228 302c 3129 3b30 3b31 3234 3b28 302c 3229 006d 656d 6772 6f75 703a 5328 372c 3829 0070
3261660 6865 6164 3a53 2832 2c31 2900 646f 5f71 7565 7279 3a53 2830 2c32 2900 7072 6776 6572 7369 6f6e 3a53 2830 2c32 2900 7368
3261740 6f72 746c 7374 3a53 2830 2c32 2900 656e 7465 7266 756e 633a 5328 372c 3130 2900 736c 6275 663a 5328 302c 3139 293d 6172
3262020 2830 2c31 293b 303b 3531 313b 2830 2c32 2900 736c 7074 723a 5328 322c 3129 0062 6c66 3a53 2832 2c31 2900 6173 6b5f 6272
3262100 6f77 7365 3a53 2830 2c31 2900 6765 6e6c 7374 666e 616d 653a 5328 302c 3129 006d 696e 5f62 726f 7773 653a 5328 302c 3129
3262160 006c 7374 666e 616d 653a 5328 322c 3129 0062 726f 7773 656c 663a 4728 322c 3129 0074 6162 7374 6f70 733a 5328 302c 3139
3262240 293d 6172 2830 2c31 293b 303b 323b 2830 2c34 2900 636f 756e 743a 5328 302c 3429 006c 696e 6563 6e74 6c3a 5328 302c 3230
3262320 293d 6172 2830 2c31 293b 303b 3739 3b28 302c 3229 006c 696e 656e 756d 3a47 2830 2c31 2900 6365 6e74 6572 313a 4728 322c
3262400 3129 006c 7374 5f74 7970 653a 4728 322c 3129 0069 6e66 6e75 6d3a 4728 302c 3129 0077 6172 6e75 6d3a 4728 302c 3129 0065
3262460 7272 6e75 6d3a 4728 302c 3129 0073 6572 726e 756d 3a47 2830 2c31 2900 7469 6e66 6e75 6d3a 4728 302c 3129 0074 7761 726e
3262540 756d 3a47 2830 2c31 2900 7465 7272 6e75 6d3a 4728 302c 3129 0074 7365 7272 6e75 6d3a 4728 302c 3129 006c 7374 6669 6c65
3262620 3a47 2939 2c33 2900 696e 6f70 656e 3a46 2839 2c31 2900 6e61 6d65 3a70 2832 2c31 2900 6d6f 6465 3a70 2832 2c31 2900 696e
3262700 636c 6f73 653a 4628 302c 3129 006c 7374 6f70 656e 3a46 2839 2c33 2900 6e61 6d65 3a70 2832 2c31 2900 6d6f 6465 3a70 2832
3262760 2c31 2900 7061 6765 6865 6164 3a70 2832 2c31 2900 6669 6c65 6e61 6d65 3a70 2832 2c31 2900 693a 2830 2c31 2900 636f 7079
3263040 3a46 2830 2c31 2900 7031 3a70 2832 2c31 2900 7032 3a70 2832 2c31 2900 6c73 7463 6c6f 7365 3a46 2830 2c31 2900 696e 7075
3263120 743a 4628 302c 3129 0063 3a28 302c 3129 0069 6e63 6368 636f 756e 743a 4628 302c 3129 0073 6c70 7269 6e74 663a 4628 302c
3263200 3129 005f 5f62 7569 6c74 696e 5f76 615f 616c 6973 743a 7028 302c 3129 0061 703a 2832 2c31 2900 6661 743a 2832 2c31 2900
3263260 6f75 7470 7574 3a46 2830 2c32 2900 633a 7028 302c 3129 0069 3a28 302c 3129 0074 7479 6f75 7470 7574 3a46 2830 2c31 2900
3263340 633a 7028 302c 3229 006e 6f70 7269 6e74 3a70 2830 2c31 2900 693a 2830 2c31 2900 6c65 785f 6c73 6969 6f3a 4628 302c 3129
3263420 0062 7566 663a 7028 322c 3129 0064 756d 6d79 3a70 2830 2c32 3129 3d2a 2832 2c31 2900 693a 7228 302c 3129 0063 3a72 2830
3263500 2c31 2900 7074 723a 7228 322c 3129 0063 6861 7273 7265 6164 3a28 302c 3129 0073 6176 6564 6c66 3a56 2830 2c31 2900 6c73
3263560 7470 7574 733a 4628 302c 3129 0074 6578 743a 7028 322c 3129 0069 3a28 302c 3129 0076 6c73 7470 7269 6e74 3a46 2830 2c31
3263640 2900 7465 7874 3a70 2832 2c31 2900 6170 3a70 2832 2c31 2900 6c69 6e65 733a 2830 2c31 2900 6370 3a28 322c 3129 006c 7374
3263720 7072 696e 743a 4628 302c 3129 005f 5f62 7569 6c74 696e 5f76 615f 616c 6973 743a 7028 302c 3129 0061 703a 2832 2c31 2900
3264000 7465 7874 3a28 322c 3129 0070 7274 6465 6c74 6162 7566 3a46 2830 2c31 2900 693a 2830 2c31 2900 6c73 7466 6c75 7368 3a46
3264060 2830 2c31 2900 693a 2830 2c31 2900 7072 696e 745f 6d73 673a 6628 302c 3129 0073 6576 6572 6974 793a 7028 302c 3229 0076
3264140 7075 7465 7272 3a46 2830 2c31 2900 6572 7263 6f64 653a 7028 302c 3129 0073 6576 6572 6974 793a 7028 302c 3129 0074 6578
3264220 743a 7028 322c 3129 0061 703a 7028 322c 3129 006d 6573 7361 6765 313a 2830 2c31 3829 006d 6573 7361 6765 323a 2830 2c31
3264300 3829 0070 7269 6e74 6d73 673a 2830 2c31 2900 7075 7465 7272 3a46 2830 2c31 2900 5f5f 6275 696c 7469 6e5f 7661 5f61 6c69
3264360 7374 3a70 2830 2c31 2900 6170 3a28 322c 3129 0065 7272 636f 6465 3a28 302c 3129 0073 6576 6572 6974 793a 2830 2c31 2900
3264440 7465 7874 3a28 322c 3129 0076 7072 7465 7272 3a46 2830 2c31 2900 6572 7263 6f64 653a 7028 302c 3129 0073 6576 6572 6974
3264520 793a 7028 302c 3129 0074 6578 743a 7028 322c 3129 0061 703a 7028 322c 3129 0070 7269 6e74 6d73 673a 2830 2c31 2900 7072
3264600 7465 7272 3a46 2830 2c31 2900 5f5f 6275 696c 7469 6e5f 7661 5f61 6c69 7374 3a70 2830 2c31 2900 6170 3a28 322c 3129 0065
3264660 7272 636f 6465 3a28 302c 3129 0073 6576 6572 6974 793a 2830 2c31 2900 7465 7874 3a28 322c 3129 0070 7574 6275 663a 4628
```

```
3264740 302c 3129 0073 3a70 2832 2c31 2900 6e65 776c 696e 653a 4628 302c 3129 006e 6c69 6e65 733a 7028 302c 3129 006e 6577 636f
3265020 6c75 6d6e 3a46 2830 2c31 2900 636f 6c6e 6f3a 7028 302c 3129 006e 6574 6e61 6d65 3a70 2832 2c31 2900 6370 3a28 322c 3129
3265100 0069 3a28 302c 3129 006e 6577 7061 6765 3a46 2830 2c31 2900 693a 2830 2c31 2900 6e65 7774 6974 6c65 3a46 2830 2c31 2900
3265160 733a 7028 322c 3129 0069 3a28 302c 3129 0070 7274 6c6f 6e67 7374 7269 6e67 3a66 2830 2c31 2900 7061 726d 313a 7028 322c
3265240 3129 006c 656e 6774 683a 7028 302c 3129 006e 3a28 302c 3129 0066 7072 746c 696e 653a 4628 302c 3129 0070 6172 6d31 3a70
3265320 2832 2c31 2900 6c65 6e67 7468 3a28 302c 3429 006e 6669 6c6c 3a28 302c 3429 006e 3a28 302c 3429 0066 696e 6974 6c69 6e65
3265400 3a46 2830 2c31 2900 6e65 7774 7261 696c 6572 3a46 2830 2c31 2900 733a 7028 322c 3129 0069 3a28 302c 3129 0074 6f74 6573
3265460 756d 3a46 2830 2c31 2900 7065 726d 666c 6167 3a70 2830 2c32 2900 7374 7277 6172 6e75 6d3a 2830 2c32 3229 3d61 7228 302c
3265540 3129 3b30 3b36 3b28 302c 3229 0073 7472 6572 726e 756d 3a28 302c 3232 2900 7374 7273 6572 726e 756d 3a28 302c 3232 2900
3265620 7474 7970 7274 6573 756d 3a66 2830 2c31 2900 7272 7465 7375 6d3a 4628 302c 3129 006c 7369 6578 6974 3a46 2830 2c31 2900
3265700 7472 6d6c 6962 3a28 382c 3529 0064 6f5f 6578 6974 3a66 2830 2c31 2900 6578 5f63 6f64 653a 2830 2c31 2900 6675 6e63 6c69
3265760 7374 3a54 2830 2c32 3329 3d73 3866 756e 633a 2837 2c31 3029 2c30 2c33 323b 6e65 7874 3a28 302c 3234 293d 2a28 302c 3233
3266040 292c 3332 2c33 323b 3b00 4655 4e43 4c49 5354 3a74 2830 2c32 3329 0078 6f6e 6162 6f72 746c 6973 743a 5328 302c 3234 2900
3266120 6f6e 6162 6f72 743a 6628 302c 3129 0070 7472 3a28 302c 3234 2900 6c73 6978 6f6e 6162 6f72 743a 4628 302c 3129 0070 7472
3266200 3a70 2837 2c31 3029 006d 656d 6770 3a70 2837 2c38 2900 6e65 7766 756e 633a 2830 2c32 3429 006c 7369 6162 6f72 743a 4628
3266260 302c 3129 005f 5f62 7569 6c74 696e 5f76 615f 616c 6973 743a 7028 302c 3129 0061 703a 2832 2c31 2900 6572 7263 6f64 653a
3266340 2830 2c31 2900 7365 7665 7269 7479 3a28 302c 3129 0074 6578 743a 2832 2c31 2900 7472 6d6c 6962 3a28 382c 3529 0065 7869
3266420 7463 6f64 653a 2830 2c31 2900 6c73 6365 6e74 6572 3a46 2830 2c31 2900 6172 6763 3a70 2830 2c31 2900 6172 6776 3a70 2830
3266500 2c32 3129 0070 726f 676e 616d 653a 7028 322c 3129 0070 726f 6776 6572 3a70 2832 2c31 2900 7465 7874 3a70 2832 2c31 2900
3266560 7072 696e 7470 7267 7665 7273 696f 6e3a 6628 302c 3129 0070 726f 676e 616d 653a 7028 322c 3129 0070 726f 6776 6572 3a70
3266640 2832 2c31 2900 726e 756d 3a28 302c 3235 2931 6172 2830 2c31 293b 303b 3339 3b28 302c 3229 0064 6174 653a 2830 2c32 3529
3266720 0072 6561 645f 626c 663a 6628 302c 3129 0070 7472 3a28 322c 3129 0077 616e 7473 746f 3a66 2830 2c31 2900 6368 3a28 302c
3267000 3129 0077 7269 7465 6c73 7466 6e61 6d65 3a66 2830 2c31 2900 686f 7762 6164 3a70 2830 2c31 2900 7768 6963 6874 696d 653a
3267060 7028 302c 3129 0066 703a 2839 2c33 2900 7368 6f75 6c64 5f64 6973 703a 2830 2c31 2900 6c73 6965 6e74 666e 3a46 2830 2c31
3267140 2900 663a 7028 372c 3130 2900 646f 5f6f 7074 7472 6c3a 6628 302c 3129 0069 3a28 302c 3129 006d 656d 5f65 7868 6175 7374
3267220 6564 3a46 2830 2c31 2900 7273 6574 7376 7067 6e6f 3a46 2830 2c31 2900 6469 7370 6e6f 3a70 2830 2c32 2900 6e64 6973 703a
3267300 7028 302c 3229 006e 6574 6e61 6d65 3a70 2832 2c31 2900 7072 7468 6561 643a 4628 302c 3129 0072 6573 6574 6865 6164 3a46
3267360 2830 2c31 2900 6e65 746e 616d 653a 7028 322c 3129 0070 6167 6568 6561 643a 7028 322c 3129 0063 7031 3a28 322c 3129 0063
3267440 7032 3a28 322c 3129 0065 6c73 7466 6c75 7368 3a46 2830 2c31 2900 693a 2830 2c31 2900 6d6f 6e5f 696e 6974 3a46 2830 2c31
3267520 2900 2f75 7372 2f69 6e63 6c75 6465 2f63 7479 7065 2e68 0069 736e 756d 6265 723a 4628 302c 3129 0063 703a 7028 322c 3129
3267600 006c 7369 6f70 746e 2e6f 005f 6375 725f 6e61 7267 005f 6e6f 6e5f 6172 6700 5f64 6f5f 6465 666c 7300 5f64 6f5f 6e61 7267
3267660 7300 5f64 6566 6c6c 6973 7400 5f6f 7067 726f 7570 005f 6765 6e74 7261 696c 005f 7270 6f73 7461 6200 5f6d 6172 6b00 5f6c
3267740 7369 7379 7369 6400 5f6c 7369 6465 6669 6400 5f69 6e69 745f 6f70 7469 6f6e 7300 5f64 6f5f 6f70 7469 6f6e 005f 6465 6669
3270020 6e65 5f6f 7000 5f6d 615f 6964 005f 6465 6670 6f73 005f 6c73 6967 7061 6c69 6400 5f72 6373 6964 005f 6e6f 6e5f 636f 756e
3270100 7400 5f6f 7074 5f63 6f75 6e74 005f 706f 735f 636f 756e 7400 5f66 696e 646f 7074 696f 6e00 5f6f 706c 6973 7400 5f65 7272
3270160 6578 6974 002f 696f 6d65 2f6f 7361 7332 2f62 2f64 6576 2f4c 4942 532f 7265 6c31 302f 4c53 492f 7375 6e34 2f00 6c73 696f
3270240 7074 6e2e 6300 696e 743a 7428 302c 3129 3d72 2830 2c31 293b 2d32 3134 3734 3833 3634 383b 3231 3437 3438 3336 3437 3b00
3270320 6368 6172 3a74 2830 2c32 293d 7228 302c 3229 3b30 3b31 3237 3b00 6c6f 6e67 3a74 2830 2c33 293d 7228 302c 3129 3b2d 3231
3270400 3437 3438 3336 3438 3b32 3134 3734 3833 3634 373b 0073 686f 7274 3a74 2830 2c34 293d 7228 302c 3129 3b2d 3332 3736 383b
3270460 3332 3736 373b 0075 6e73 6967 6e65 6420 6368 6172 3a74 2830 2c35 293d 7228 302c 3129 3b30 3b32 3535 3b00 756e 7369 676e
3270540 6564 2073 686f 7274 3a74 2830 2c36 293d 7228 302c 3129 3b30 3b36 3535 3335 3b00 756e 7369 676e 6564 206c 6f6e 673a 7428
3270620 302c 3729 3d72 2830 2c31 293b 303b 2d31 3b00 756e 7369 676e 6564 2069 6e74 3a74 2830 2c38 293d 7228 302c 3129 3b30 3b2d
3270700 313b 0066 6c6f 6174 3a74 2830 2c39 293d 7228 302c 3129 3b34 3b30 3b00 646f 7562 6c65 3a74 2830 2c31 3029 3d72 2830 2c31
3270760 293b 383b 303b 0076 6f69 643a 7428 302c 3131 293d 2830 2c31 3129 003f 3f3f 3a74 2830 2c31 3229 3d28 302c 3129 0072 6373
3271040 6964 3a53 2830 2c31 3329 3d61 7228 302c 3129 3b30 3b36 313b 2830 2c32 2900 2f75 7372 2f69 6e63 6c75 6465 2f73 7464 696f
3271120 2e68 002e 2f6c 7369 6465 662e 6800 2e2f 6c73 6964 6566 2e68 006c 7369 6465 6669 643a 5328 322c 3129 3d61 7228 302c 3129
3271200 3b30 3b36 303b 2830 2c32 2900 2e2f 6c73 6973 7973 2e68 002e 2f6c 7369 7379 732e 6800 6c73 6973 7973 6964 3a53 2830 2c31
3271260 3329 0066 696c 6569 6e66 6f3a 5428 332c 3129 3d73 3136 756e 6971 7565 5f69 643a 2833 2c32 293d 2a28 302c 3229 2c30 2c33
3271340 323b 666e 616d 653a 2833 2c32 292c 3332 2c33 323b 7265 765f 6461 7465 3a28 332c 3229 2c36 342c 3332 3b74 6f74 616c 5f62
3271420 7974 6573 3a28 302c 3129 2c39 362c 3332 3b3b 0046 494c 4549 4e46 4f3a 7428 332c 3129 002e 2f6c 7369 6770 616c 2e68 002e
3271500 2f6c 7369 6770 616c 2e68 006c 7369 6770 616c 6964 3a53 2834 2c31 2931 6172 2830 2c31 293b 303b 3632 3b28 302c 3229 002f
3271560 7573 722f 6c73 692f 6465 762f 746f 6f6c 6c69 622f 696e 636c 7564 652f 6d61 2e68 002f 7573 722f 6c73 692f 6465 762f 746f
3271640 6f6c 6c69 622f 696e 636c 7564 652f 6d61 2e68 006d 615f 6964 3a53 2835 2c31 293d 6172 2830 2c31 293b 303b 3539 3b28 302c
3271720 3229 0070 6f69 6e74 6572 3a74 2835 2c32 293d 2a28 352c 3329 3d61 7228 302c 3129 3b30 3b30 3b28 352c 3429 3d61 7228 302c
3272000 3129 3b30 3b30 3b28 352c 3529 3d61 7228 302c 3129 3b30 3b30 3b28 352c 3629 3d61 7228 302c 3129 3b30 3b30 3b28 352c 3729
```

```
3272060 3d61 7228 302c 3129 3b30 3b30 3b28 352c 3829 3d61 7228 302c 3129 3b30 3b30 3b28 302c 3229 0062 6f6f 6c65 616e 3a74 2830
3272140 2c31 2900 6d61 5f67 726f 7570 3a74 2835 2c39 293d 2a28 352c 3130 2931 7334 6d61 5f67 726f 7570 3a28 302c 3129 2c30 2c33
3272220 323b 3b00 6675 6e63 7469 6f6e 3a74 2835 2c31 3129 3d2a 2835 2c31 3229 3d66 2830 2c31 2900 6d65 6d5f 616c 6c6f 6361 7465
3272300 643a 4728 302c 3129 006d 656d 5f75 7365 643a 4728 302c 3129 006f 7574 5f6f 665f 6d65 6d6f 7279 5f66 756e 6374 696f 6e3a
3272360 4728 352c 3131 2900 7374 7269 6e67 3a74 2833 2c32 2900 6f70 7469 5245 433a 5428 302c 3134 293d 7332 346e 6578 743a 2830
3272440 2c31 3529 3d2a 2830 2c31 3429 2c30 2c33 323b 7479 7065 3a28 302c 3129 2c33 322c 3332 3b6f 703a 2833 2c32 292c 3634 2c33
3272520 323b 6f70 706e 743a 2833 2c32 292c 3936 2c33 323b 6f70 7661 6c3a 2830 2c31 292c 3132 382c 3332 3b6d 6172 6b65 643a 2830
3272600 2c31 292c 3136 302c 3332 3b3b 006f 7074 6972 6563 3a74 2830 2c31 3429 006f 7074 693a 7428 302c 3135 2900 6f70 656e 7452
3272660 4543 3a54 2830 2c31 3629 3d73 3136 7479 7065 3a28 302c 3129 2c30 2c33 323b 6f70 3a28 332c 3229 2c33 322c 3332 3b6f 7070
3272740 6e74 3a28 332c 3229 2c36 342c 3332 3b6f 7076 616c 3a28 302c 3229 2c39 362c 383b 3b00 6f70 656e 7472 6563 3a74 2830 2c31
3273020 3629 006f 7065 6e74 3a74 2830 2c31 3729 3d2a 2830 2c31 3629 0063 6f70 656e 7452 4543 3a54 2830 2c31 3829 3d73 3136 7479
3273100 7065 3a28 302c 3129 2c30 2c33 323b 636f 703a 2830 2c32 292c 3332 2c39 3b63 6f70 706e 743a 2833 2c32 292c 3634 2c33 323b
3273160 636f 7076 616c 3a28 302c 3229 2c39 362c 383b 3b00 636f 7065 6e74 7265 633a 7428 302c 3138 2900 636f 7065 6e74 3a74 2830
3273240 2c31 3929 3d2a 2830 2c31 3829 0066 696c 656e 616d 653a 4728 332c 3229 006c 7369 6f70 746e 2e63 0070 6f73 5f61 7267 3a47
3273320 2830 2c32 3029 3161 7228 302c 3129 3b30 3b32 3034 3b28 332c 3229 006f 7074 5f73 6574 3a47 2830 2c32 3129 3d61 7228 302c
3273400 3129 3b30 3b34 3039 3b28 332c 3229 0070 6f73 5f63 6f75 6e74 3a53 2830 2c31 2900 6465 6670 6f73 3a53 2830 2c31 2900 6e6f
3273460 6e5f 636f 756e 743a 5328 302c 3129 0063 7572 5f6e 6172 673a 5328 302c 3129 006f 7074 5f63 6f75 6e74 3a53 2830 2c31 2900
3273540 6f70 6c69 7374 3a53 2830 2c31 3529 0064 6566 6c6c 6973 743a 5328 302c 3135 2900 6f70 6772 6f75 703a 5328 352c 3929 0072
3273620 706f 7374 6162 3a53 2830 2c32 3229 3d61 7229 302c 3129 3b30 3b32 3034 3b28 302c 3233 293d 2a28 332c 3229 006e 6f6e 5f61
3273700 7267 3a53 2830 2c32 3029 0066 6f70 5f66 696c 653a 4728 332c 3229 0066 6f70 5f6d 6f64 3a47 2833 2c32 2900 6572 7265 7869
3273760 743a 6628 302c 3129 0073 3a70 2333 2c32 2900 696e 6974 5f6f 7074 696f 6e73 3a66 2830 2c31 2900 6669 6e64 6f70 7469 6f6e
3274040 3a66 2830 2c31 3529 006f 7074 3a70 2833 2c32 2900 7074 723a 2830 2c31 3529 0064 6566 696e 655f 6f70 3a66 2830 2c31 2900
3274120 7479 7065 3a70 2833 2c31 2900 6f70 3a70 2833 2c32 2900 6f70 706e 743a 7028 332c 3229 006f 7076 616c 3a70 2830 2c31 2900
3274200 7074 723a 2830 2c31 3529 0064 6566 6f70 7469 6f6e 3a46 2830 2c31 2900 7479 7065 3a70 2830 2c31 2900 6f70 3a70 2833 2c32
3274260 2900 6f70 706e 743a 7028 332c 3229 006f 7076 616c 3a70 2830 2c31 2900 7074 723a 2833 2c32 2900 7265 6164 5f6f 7074 6162
3274340 6c65 733a 4628 302c 3129 006f 705f 7461 523a 7028 302c 3137 2900 636f 705f 7461 623a 7028 302c 3139 2900 706f 735f 7461
3274420 623a 7028 302c 3234 293d 2a28 302c 3233 2900 7074 723a 2833 2c32 2900 693a 2830 2c31 2900 6466 6c6f 7074 696f 6e3a 4628
3274500 302c 3129 006f 703a 7028 332c 3229 006f 7070 6e74 3a70 2833 2c32 2900 7074 723a 2830 2c31 3529 006c 7369 6f70 7469 6f6e
3274560 3a46 2830 2c31 2900 6172 6763 3a70 2830 2c31 2900 6172 6776 3a70 2830 2c32 3329 0073 7472 706f 733a 2830 2c32 3529 3d61
3274640 7228 302c 3129 3b30 3b31 353b 2830 2c32 2900 696e 5f70 6f73 3a28 302c 3129 0061 6c6c 5f75 7070 6572 3a28 302c 3129 0063
3274720 683a 2830 2c32 2900 6172 673a 2833 2c32 2900 6571 7074 723a 2833 2c32 2900 6375 723a 2830 2c32 3329 0072 6573 3a28 302c
3275000 3233 2900 7074 723a 2830 2c31 3529 0064 6f5f 6465 666c 733a 6628 302c 3129 0070 7472 3a28 302c 3135 2900 6465 666c 3a28
3275060 302c 3135 2900 646f 5f6e 6172 6773 3a66 2830 2c31 2900 6f70 743a 2833 2c32 2900 646f 5f6f 7074 696f 6e3a 6628 302c 3129
3275140 006f 7074 3a70 2833 2c32 2900 636f 6d5f 6c69 6e65 3a70 2830 2c31 2900 703a 2830 2c31 3529 0073 686f 7274 5f6f 7074 3a28
3275220 302c 3236 293d 6172 2830 2c31 293b 303b 323b 2830 2c32 2900 7661 6c3a 2833 2c32 2900 6d61 726b 3a66 2830 2c31 2900 6f70
3275300 706e 743a 7028 332c 3229 0070 7472 3a28 302c 3135 2900 6765 6e74 7261 696c 3a66 2830 2c31 2900 6f70 743a 7028 332c 3229
3275360 0076 616c 3a70 2833 2c32 2900 733a 2833 2c32 2900 7365 746f 7074 696f 6e3a 4628 302c 3129 006f 7074 3a70 2833 2c32 2900
3275440 6c73 6974 696d 652e 6f00 5f70 7265 7663 7075 005f 696e 6974 7265 616c 005f 6c73 6964 6566 6964 005f 7072 6576 7265 616c
3275520 005f 6d61 5f69 6400 5f6c 7369 6770 616c 6964 005f 7263 7369 6400 5f69 6e69 7463 7075 002f 686f 6d65 2f6f 7361 7332 2f62
3275600 2f64 6576 2f4c 4942 532f 7265 6c31 302f 4c53 492f 7375 6e34 2f00 6c73 6974 696d 652e 6300 696e 743a 7428 302c 3129 3d72
3275660 2830 2c31 293b 2d32 3134 3734 3833 3634 383b 3231 3437 3438 3336 3437 3b00 6368 6172 3a74 2830 2c32 293d 7228 302c 3229
3275740 3b30 3b31 3237 3b00 6c6f 6e67 3a74 2830 2c33 293d 7228 302c 3129 3b2d 3231 3437 3438 3336 3438 3b32 3134 3734 3833 3634
3276020 373b 0073 686f 7274 3a74 2833 2c34 293d 7228 302c 3129 3b2d 3332 3736 383b 3332 3736 373b 0075 6e73 6967 6e65 6420 6368
3276100 6172 3a74 2830 2c35 293d 7228 302c 3129 3b30 3b32 3535 3b00 756e 7369 676e 6564 2073 686f 7274 3a74 2830 2c36 293d 7228
3276160 302c 3129 3b30 3b36 3535 3335 3b00 756e 7369 676e 6564 206c 6f6e 673a 7428 302c 3729 3d72 2830 2c31 293b 303b 2d31 3b00
3276240 756e 7369 676e 6564 2069 6e74 3a74 2830 2c38 293d 7228 302c 3129 3b30 3b2d 313b 0066 6c6f 6174 3a74 2830 2c39 293d 7228
3276320 302c 3129 3b34 3b30 3b00 646f 7562 6c65 3a74 2830 2c31 3029 3d72 2830 2c31 293b 383b 303b 0076 6f69 643a 7428 302c 3131
3276400 293d 2830 2c31 3129 003f 3f3f 3a74 2830 2c31 3229 3d28 302c 3129 0072 6373 6964 3a53 2830 2c31 3329 3d61 7228 302c 3129
3276460 3b30 3b36 363b 2830 2c32 2900 2f75 7372 2f69 6e63 6c75 6465 2f73 7464 696f 2e68 002e 2f6c 7369 6465 662e 6800 2e2f 6c73
3276540 6964 6566 2e68 006c 7369 6465 6669 643a 5328 322c 3129 3d61 7228 302c 3129 3b30 3b36 303b 2830 2c32 2900 2e2f 6c73 6967
3276620 7061 6c2e 6800 2e2f 6c73 6967 7061 6c2e 6800 6c73 6967 7061 6c69 643a 5328 332c 3129 3d61 7228 302c 3129 3b30 3b36 323b
3276700 2830 2c32 2900 2f75 7372 2f6c 7369 2f64 6576 2f74 6f6f 6c6c 6962 2f69 6e63 6c75 6465 2f6d 612e 6800 2f75 7372 2f6c 7369
3276760 2f64 6576 2f74 6f6f 6c6c 6962 2f69 6e63 6c75 6465 2f6d 612e 6800 6d61 5f69 643a 5328 342c 3129 3d61 7228 302c 3129 3b30
3277040 3b35 393b 2830 2c32 2900 706f 696e 7465 723a 7428 342c 3229 3d2a 2834 2c33 293d 6172 2830 2c31 293b 303b 303b 2834 2c34
3277120 293d 6172 2830 2c31 293b 303b 303b 2834 2c35 293d 6172 2830 2c31 293b 303b 303b 2834 2c36 293d 6172 2830 2c31 293b 303b
```

```
3277200 303b 2834 2c37 293d 6172 2830 2c31 293b 303b 303b 2834 2c38 293d 6172 2830 2c31 293b 303b 303b 2830 2c32 2900 626f 6f6c
3277260 6561 6e3a 7428 302c 3129 006d 615f 6772 6f75 703a 7428 342c 3929 3d2a 2834 2c31 3029 3d73 346d 615f 6772 6f75 703a 2830
3277340 2c31 292c 302c 3332 3b3b 0066 756e 6374 696f 6e3a 7428 342c 3131 293d 2a28 342c 3132 293d 6628 302c 3129 006d 656d 5f61
3277420 6c6c 6f63 6174 6564 3a47 2830 2c31 2900 6d65 615f 7573 6564 3a47 2830 2c31 2900 6f75 745f 6f66 5f6d 656d 6f72 795f 6675
3277500 6e63 7469 6f6e 3a47 2834 2c31 3129 0073 7461 7473 3a47 2830 2c32 2900 6c73 6974 696d 652e 6300 696e 6974 6370 753a 5328
3277560 302c 3129 0069 6e69 7472 6561 6c3a 5328 302c 3129 0070 7265 7663 7075 3a53 2830 2c31 2900 7072 6576 7265 616c 3a53 2830
3277640 2c31 2900 696e 6974 7469 6d65 3a46 2830 2c31 2900 6461 726b 7469 6d65 3a46 2830 2c31 2900 7461 673a 7028 302c 3134 293d
3277720 2a28 302c 3229 0063 7075 7469 6d65 3a28 302c 3129 0072 6561 6c74 696d 653a 2830 2c31 2900 6370 7569 6e74 763a 2830 2c31
3300000 2900 6370 753a 2830 2c31 3029 0072 6561 6c3a 2830 2c31 3029 0070 6572 6365 6e74 3a28 302c 3130 2900 6370 7573 7472 3a28
3300060 302c 3135 293d 6172 2830 2c31 293b 303b 3131 3b28 302c 3229 0074 6d61 726b 7469 6d65 3a46 2830 2c31 2900 7461 673a 7028
3300140 302c 3134 2900 6370 7574 696d 653a 2830 2c31 2900 7265 616c 7469 6d65 3a28 302c 3129 0063 7075 696e 7476 3a28 302c 3129
3300220 0063 7075 3a28 302c 3929 0072 6561 6c3a 2830 2c39 2900 7065 7263 656e 743a 2830 2c39 2900 6370 7573 7472 3a28 302c 3135
3300300 2900 746f 7474 696d 653a 4628 302c 3129 0074 6167 3a70 2830 2c31 3429 0063 7075 7469 6d65 3a28 302c 3129 0072 6561 6c74
3300360 696d 653a 2830 2c31 2900 6370 753a 2830 2c39 2900 7265 616c 3a28 302c 3929 0070 6572 6365 6e74 3a28 302c 3929 006c 7369
3300440 7472 6c2e 6f00 5f66 6e61 6d65 636d 7000 5f6c 7369 7472 6c69 6400 5f5c 6962 6465 6669 6400 5f6c 7369 7379 7369 6400 5f73
3300520 6166 655f 6d61 6c6c 6f63 005f 6265 6773 7472 005f 6161 5f69 6400 5f74 7261 696c 7374 7200 5f65 6e64 7374 7200 5f6c 7369
3300600 6770 616c 6964 005f 7263 7369 6400 5f73 7472 5f67 726f 7570 002f 686f 6d65 2f6f 7361 7332 2f62 2f64 6576 2f4c 4942 532f
3300660 7265 6c31 302f 4c53 492f 7375 6e34 2f00 6c73 6974 726c 2e63 0069 6e74 3a74 2830 2c31 293d 7228 302c 3129 3b2d 3231 3437
3300740 3438 3336 3438 3b32 3134 3734 3333 3634 373b 0063 6861 723a 7428 302c 3229 3d72 2830 2c32 293b 303b 3132 373b 006c 6f6e
3301020 673a 7428 302c 3329 3d72 2830 2c31 293b 2d32 3134 3734 3833 3634 383b 3231 3437 3438 3336 3437 3b00 7368 6f72 743a 7428
3301100 302c 3429 3d72 2830 2c31 293b 2d33 3237 3638 3b33 3237 3637 3b00 756e 7369 676e 6564 2063 6861 723a 7428 302c 3529 3d72
3301160 2830 2c31 293b 303b 3235 353b 0075 6e73 6967 6e65 6420 7368 6f72 743a 7428 302c 3629 3d72 2830 2c31 293b 303b 3635 3533
3301240 353b 0075 6e73 6967 6e65 6420 6c6f 6e67 3a74 2830 2c37 293d 7228 302c 3129 3b30 3b2d 313b 0075 6e73 6967 6e65 6420 696e
3301320 743a 7428 302c 3829 3d72 2830 2c31 293b 303b 2d31 3b00 666c 6f61 743a 7428 302c 3929 3d72 2830 2c31 293b 343b 303b 0064
3301400 6f75 626c 653a 7428 302c 3130 293d 7228 302c 3129 3b38 3b30 3b00 766f 6964 3a74 2830 2c31 3129 3d28 302c 3131 2900 3f3f
3301460 3f3a 7428 302c 3132 293d 2830 2c31 2900 7263 7369 643a 5328 302c 3133 293d 6172 2830 2c31 293b 303b 3635 3b28 302c 3229
3301540 002f 7573 722f 696e 636c 7564 652f 7374 6469 6f2e 6800 2e2f 6c73 6973 7973 2e68 002e 2f6c 7369 7379 732e 6800 6c73 6973
3301620 7973 6964 3a53 2832 2c31 293d 6172 2830 2c31 293b 303b 3631 3b28 302c 3229 0066 696c 6569 6e66 6f3a 5428 322c 3229 3d73
3301700 3136 756e 6971 7565 5f69 643a 2832 2c33 293d 2a28 302c 3229 2c30 2c33 323b 666e 616d 653a 2832 2c33 292c 3332 2c33 323b
3301760 7265 765f 6461 7465 3a28 322c 3329 2c36 342c 3332 3b74 6f74 616c 5f62 7974 6573 3a28 302c 3129 2c39 362c 3332 3b3b 0046
3302040 494c 4549 4e46 4f3a 7428 322c 3229 002e 2f6c 7369 6770 616c 2e68 002e 2f6c 7369 6770 616c 2e68 006c 7369 6770 616c 6964
3302120 3a53 2833 2c31 293d 6172 2830 2c31 293b 303b 3632 3b28 302c 3229 002f 7573 722f 6c73 692f 6465 762f 746f 6f6c 6c69 622f
3302200 696e 636c 7564 652f 6d61 2e68 002f 7573 722f 6c73 692f 6465 762f 746f 6f6c 6c69 622f 696e 636c 7564 652f 6d61 2e68 006d
3302260 615f 6964 3a53 2834 2c31 293d 6172 2830 2c31 293b 303b 3539 3b28 302c 3229 0070 6f69 6e74 6572 3a74 2834 2c32 293d 2a28
3302340 342c 3329 3d61 7228 302c 3129 3b30 3b30 3b28 342c 3429 3d61 7228 302c 3129 3b30 3b30 3b28 342c 3529 3d61 7228 302c 3129
3302420 3b30 3b30 3b28 342c 3629 3d61 7228 302c 3129 3b30 3b30 3b28 342c 3729 3d61 7228 302c 3129 3b30 3b30 3b28 342c 3829 3d61
3302500 7228 302c 3129 3b30 3b30 3b28 302c 3229 0062 6f6f 6c65 616e 3a74 2830 2c31 2900 6d61 5f67 726f 7570 3a74 2834 2c39 293d
3302560 2a28 342c 3130 293d 7334 6d61 5f67 726f 7570 3a28 302c 3129 2c30 2c33 323b 3b00 6675 6e63 7469 6f6e 3a74 2834 2c31 3129
3302640 3d2a 2834 2c31 3229 3d66 2830 2c31 2900 6d65 6d5f 616c 6c6f 6361 7465 643a 4728 302c 3129 006d 656d 5f75 7365 643a 4728
3302720 302c 3129 006f 7574 5f6f 665f 6d65 6d6f 7279 5f66 756e 6374 696f 6e3a 4728 342c 3131 2900 2e2f 6c69 6264 6566 2e68 002e
3303000 2f6c 6962 6465 662e 6800 6c69 6264 6566 6964 3a53 2833 2c31 2900 7573 6572 6c69 623a 5428 352c 3129 3d73 3478 5f6c 6962
3303060 7261 7279 3a28 302c 3129 2c30 2c33 323b 3b00 4c49 4252 4152 593a 7428 352c 3129 0075 7365 726d 656d 623a 5428 352c 3229
3303140 3d73 3478 5f6d 656d 6265 723a 2830 2c31 292c 302c 3332 3b3b 004d 454d 4245 523a 7428 352c 3229 0075 7365 726c 656e 743a
3303220 5428 352c 3329 3473 386d 6e61 6d65 3a28 322c 3329 2c30 2c33 323b 6d73 697a 653a 2830 2c31 292c 3332 2c33 323b 3b00 4c49
3303300 424e 414d 3a74 2835 2c33 2900 7573 6572 6d69 6e66 6f3a 5428 352c 3429 3d73 3230 5c70 3a28 352c 3529 3d2a 2835 2c31 292c
3303360 302c 3332 3b6c 6e61 6d65 3a28 322c 3329 2c33 322c 3332 3b6d 6e61 6d65 3a28 322c 3329 2c36 342c 3332 3b6d 7369 7a65 3a28
3303440 302c 3129 2c39 362c 3332 3b72 7761 3a28 302c 3229 2c31 3238 2c38 3b70 6164 313a 2830 2c32 292c 3133 362c 383b 7061 6432
3303520 3a28 302c 3229 2c31 3434 2c38 3b70 6164 333a 2830 2c32 292c 3135 322c 383b 3b00 4d45 4d42 494e 464f 3a74 2835 2c34 2900
3303600 6c69 6274 726f 6e3a 4728 302c 3129 006c 6962 7265 6173 6f6e 3a47 2830 2c31 2900 6c69 6263 7279 7074 3a47 2830 2c31 2900
3303660 6c69 6263 6f6d 7361 743a 4728 302c 3129 002e 2f6c 7369 7472 6c2e 6800 2e2f 6c73 6974 726c 2e68 006c 7369 7472 6c69 643a
3303740 5328 362c 3129 3d61 7228 302c 3129 3b30 3b36 343b 2830 2c32 2900 666e 616d 655f 7374 7275 6374 3a54 2836 2c32 293d 7331
3304020 3266 703a 2836 2c33 293d 2a28 312c 3129 2c30 2c33 323b 666e 616d 653a 2832 2c33 292c 3332 2c33 323b 6368 6169 6e3a 2836
3304100 2c34 293d 2a28 362c 3229 2c36 342c 3332 3b3b 0046 4e41 4d45 5f53 5452 5543 543a 7428 362c 3229 0074 7261 696c 5f73 7472
3304160 7563 743a 5428 362c 3529 3d73 3136 6865 6164 3a28 362c 3729 3d2a 2836 2c36 293d 7873 7472 6169 6c5f 6865 6164 3a2c 302c
3304240 3332 3b67 726f 7570 3a28 342c 3929 2c33 322c 3332 3b66 696c 655f 6c69 7374 3a28 362c 3429 2c36 342c 3332 3b73 6f75 7263
```

```
3304320 655f 7074 723a 2932 2c33 292c 3936 2c33 323b 3b00 5452 4149 4c5f 5354 5255 4354 3a74 2836 2c35 2900 7472 6169 6c5f 6865
3304400 6164 3a54 2836 2c36 293d 7332 3470 726f 676e 616d 653a 2832 2c33 292c 302c 3332 3b76 6572 7369 6f6e 3a28 322c 3329 2c33
3304460 322c 3332 3b63 7572 725f 7469 6d65 3a28 322c 3329 2c36 342c 3332 3b6f 7074 696f 6e73 3a28 362c 3131 293d 2a28 362c 3829
3304540 3d78 736f 7074 696f 6e5f 6c69 7374 3a2c 3936 2c33 323b 6669 6c65 733a 2836 2c31 3229 3d2a 2836 2c39 293d 7873 6669 6c65
3304620 5f6c 6973 743a 2c31 3238 2c33 323b 6c69 6273 3a28 362c 3133 293d 2a28 362c 3130 293d 7873 6c69 625f 6c69 7374 3a2c 3136
3304700 302c 3332 3b3b 0054 5241 494c 5f48 4541 443a 7428 362c 3629 006f 7074 696f 6e5f 6c69 7374 3a54 2836 2c38 293d 7332 3467
3304760 726f 7570 3a28 322c 3329 2c30 2c33 323b 6e61 6d65 3a28 322c 3329 2c33 322c 3332 3b76 616c 7565 3a28 322c 3329 2c36 342c
3305040 3332 3b75 6e69 743a 2832 2c33 292c 3936 2c33 323b 7065 726d 666c 6167 3a28 302c 3229 2c31 3238 2c38 3b70 6164 3a28 362c
3305120 3134 293d 6172 2830 2c31 293b 303b 323b 2830 2c32 292c 3133 362c 3234 3b63 6861 696e 3a28 362c 3135 293d 2a28 362c 3829
3305200 2c31 3630 2c33 323b 3b00 4f50 5449 4f4e 5f4c 4953 543a 7428 362c 3829 0066 696c 655f 6c69 7374 3a54 2836 2c39 293d 7333
3305260 326e 616d 653a 2832 2c33 292c 302c 3332 3b66 6e61 6d65 3a28 322c 3329 2c33 322c 3332 3b63 686b 7375 6d3a 2832 2c33 292c
3305340 3634 2c33 323b 7265 765f 6461 7465 3a28 322c 3329 2c39 362c 3332 3b72 773a 2830 2c32 292c 3132 382c 383b 7061 643a 2836
3305420 2c31 3429 2c31 3336 2c32 343b 6869 7374 3a28 362c 3136 293d 2a28 362c 3629 2c31 3630 2c33 323b 7265 663a 2836 2c31 3629
3305500 2c31 3932 2c33 323b 6368 6169 6e3a 2836 2c31 3729 3d2a 2836 2c39 292c 3232 342c 3332 3b3b 0046 494c 455f 4c49 5354 3a74
3305560 2836 2c39 2900 6c69 625f 6c69 7374 3a54 2836 2c31 3029 3d73 3230 6e61 6d65 3a28 322c 3329 2c30 2c33 323b 666e 616d 653a
3305640 2832 2c33 292c 3332 2c33 323b 756e 6971 7565 5f69 643a 2832 2c33 292c 3634 2c33 323b 6d65 6d62 733a 2836 2c31 3929 3d2a
3305720 2936 2c31 3829 3178 736d 656d 625f 6c69 7374 3a2c 3936 2c33 323b 6368 6169 6e3a 2836 2c32 3029 3d2a 2836 2c31 3029 2c31
3306000 3238 2c33 323b 3b00 4c49 425f 4c49 5354 3a74 2836 2c31 3029 006d 656d 625f 6c69 7374 3a54 2836 2c31 3829 3d73 3332 6e61
3306060 6d65 3a28 322c 3329 2c30 2c33 323b 7265 765f 6461 7465 3a28 322c 3329 2c33 322c 3332 3b72 773a 2830 2c32 292c 3634 2c38
3306140 3b70 6164 313a 2836 2c31 3429 2c37 322c 3234 3b68 6973 743a 2836 2c31 3629 2c39 362c 3332 3b72 6566 3a28 362c 3136 292c
3306220 3132 382c 3332 3b70 6572 6d66 6c61 673a 2830 2c32 292c 3136 302c 383b 7061 6432 3a28 362c 3134 292c 3136 382c 3234 3b5c
3306300 006d 703a 2836 2c32 3129 3d2a 2835 2c32 292c 3139 322c 3332 3b63 6861 696e 3a28 362c 3232 293d 2a28 362c 3138 292c 3232
3306360 342c 3332 3b3b 004d 454d 425f 4c49 5354 3a74 2836 2c31 3829 0070 6172 7365 5f73 7472 7563 743a 5428 362c 3233 293d 7338
3306440 6865 6164 3a28 322c 3329 2c30 2c33 323b 7461 696c 3a28 322c 3329 2c33 322c 3332 3b3b 0050 4152 5345 5f53 5452 5543 543a
3306520 7428 362c 3233 2900 7472 6964 5f73 7472 7563 743a 5428 362c 3234 293d 7331 3668 6561 643a 2836 2c31 3629 2c30 2c33 323b
3306600 7265 663a 2836 2c32 3529 3d2a 2936 2c31 3629 2c33 322c 3332 3b64 6570 7468 3a28 302c 3429 2c36 342c 3136 3b6d 6172 6b3a
3306660 2830 2c34 292c 3930 2c31 363b 6368 6169 6e3a 2836 2c32 3629 3d2a 2836 2c32 3429 2c39 362c 3332 3b3b 0054 5249 4d5f 5354
3306740 5255 4354 3a74 2836 2c32 3429 0061 7564 6974 5f74 7261 696c 3a47 2830 2c31 3429 3d2a 2836 2c35 2900 7472 6169 6c73 7472
3307020 3a53 2832 2c33 2900 6c73 7466 696c 653a 4728 362c 3329 0073 7472 5f67 726f 7570 3a53 2834 2c39 2900 7374 7262 6c6f 636b
3307100 3a54 2830 2c31 3529 3d73 3530 3873 7472 3a28 302c 3136 293d 6172 2830 2c31 293b 303b 3439 393b 2830 2c32 292c 302c 3430
3307160 3030 3b65 6e64 3a28 302c 3129 2c34 3030 302c 3332 3b63 6861 696e 3a28 302c 3137 293d 2a28 302c 3135 292c 3430 3332 2c33
3307240 323b 3b00 5354 5242 4c4f 434b 3a74 2830 2c31 3529 0062 6567 7374 723a 5328 302c 3137 2900 656e 6473 7472 3a53 2830 2c31
3307320 3729 0063 6861 7270 6169 723a 5428 302c 3138 293d 7338 6370 313a 2832 2c33 292c 302c 3332 3b63 7032 3a28 322c 3329 2c33
3307400 322c 3332 3b3b 0043 4841 5250 4149 523a 7428 302c 3138 2900 7361 6665 5f6d 616c 6c6f 633a 6628 322c 3329 006c 656e 3a70
3307460 2830 2c38 2900 6c73 6974 726c 2e63 0070 7472 3a28 322c 3329 0069 6e69 7472 6169 6c3a 4628 302c 3134 2900 7072 6f67 5f6e
3307540 616d 653a 7028 322c 3329 0070 726f 675f 7665 723a 7028 322c 3329 0073 7472 6169 6c3a 2830 2c31 3429 0074 7261 696c 3a28
3307620 362c 3136 2900 746d 705f 6772 6f75 703a 2834 2c39 2900 6f70 7474 7261 696c 3a46 2830 2c31 2900 6f70 745f 6772 6f75 703a
3307700 7028 322c 3329 006f 7074 5f6e 616d 653a 7028 322c 3329 006f 7074 5f76 616c 3a70 2832 2c33 2900 7661 6c5f 756e 6974 3a70
3307760 2832 2c33 2900 7065 726d 666c 6167 3a70 2830 2c32 2900 7472 6169 6c3a 2836 2c31 3629 006f 7074 3a28 362c 3135 2900 666c
3310040 6f70 656e 3a46 2836 2c33 2900 6e61 6d65 3a70 2832 2c33 2900 6d6f 6465 3a70 2832 2c33 2900 6669 6c65 5f70 7472 3a28 362c
3310120 3329 0066 666c 6f77 656e 3a46 2836 2c33 2900 6e61 6d65 3a70 2832 2c33 2900 6d6f 6465 3a70 2832 2c33 2900 6669 6c65 5f70
3310200 7472 3a28 362c 3329 0066 696c 656f 7065 6e3a 4628 362c 3329 006e 616d 653a 7028 322c 3329 006d 6f64 653a 7028 322c 3329
3310260 0064 6466 6c61 673a 7028 302c 3129 0074 7261 696c 3a28 362c 3136 2900 6669 6c65 733a 2836 2c31 3729 0066 696e 663a 2830
3310340 2c31 3929 3d2a 2832 2c32 2900 6669 6c65 5f70 7472 3a28 362c 3329 0066 6c3a 2836 2c34 2900 6368 6b73 756d 3a28 322c 3329
3310420 0066 696c 6568 6973 743a 4629 302c 3129 0073 6869 7374 3a70 2830 2c31 3429 0066 696c 6573 3a28 362c 3137 2900 666c 3a28
3310500 362c 3429 0063 6c6f 7365 7472 6169 6c3a 4628 302c 3129 0073 7472 6169 6c3a 7028 302c 3134 2900 6d65 6d62 6869 7374 3a46
3310560 2830 2c31 2900 7368 6973 743a 7028 302c 3134 2900 6c69 6273 3a28 362c 3230 2900 6d65 6d62 733a 2836 2c32 3229 006d 696e
3310640 663a 2830 2c32 3029 3d2a 2835 2c34 2900 6d65 6162 5f70 7472 3a28 362c 3231 2900 6d65 6d62 7472 6169 6c3a 4628 302c 3129
3310720 006d 656d 625f 7074 723a 7028 362c 3231 2900 7472 6169 6c3a 2836 2c31 3629 006c 6962 733a 2836 2c32 3029 006d 656d 6273
3311000 3a28 362c 3232 2900 6d69 6e66 3a28 302c 3230 2900 6c69 6e66 3a28 302c 3139 2900 7277 3a28 302c 3229 0066 6f72 6d61 7474
3311060 7261 696c 3a46 2932 2c33 2900 7374 7261 696c 3a70 2830 2c31 3429 0074 7261 696c 3a28 362c 3136 2900 7369 7a65 3a28 302c
3311140 3129 0074 7374 723a 2832 2c33 2900 6370 3a28 322c 3329 0061 703a 2932 2c33 2900 6765 6e5f 7472 6169 6c3a 4628 302c 3129
3311220 0074 7261 696c 3a70 2836 2c31 3629 006f 7074 3a28 362c 3135 2900 6669 6c65 733a 2836 2c31 3729 006c 6962 733a 2836 2c32
3311300 3029 0067 656e 5f6f 7074 3a46 2830 2c31 2900 6f70 743a 7028 362c 3135 2900 6765 6e5f 6669 6c65 3a46 2830 2c31 2900 6669
3311360 6c65 733a 7028 362c 3137 2900 6765 6e5f 6c69 623a 4628 302c 3129 006c 6962 733a 7028 362c 3230 2900 6d65 6d62 733a 2836
```

| | | | | | | | | | | | | | | | | | | | | | | | | |
|---|---|---|---|---|---|---|---|---|---|---|---|---|---|---|---|---|---|---|---|---|---|---|---|---|
| 3311440 | 2c32 | 3229 | 0067 | 656e | 5f6d | 656d | 623a | 4628 | 302c | 3129 | 006d | 656d | 6273 | 3a70 | 2836 | 2c32 | 3229 | 0064 | 656c | 7473 | 7472 | 3a46 | 2830 | 2c31 |
| 3311520 | 2900 | 6465 | 6c69 | 6d69 | 7465 | 723a | 7028 | 302c | 3229 | 0070 | 7574 | 7473 | 7472 | 3a46 | 2830 | 2c31 | 2900 | 7374 | 7269 | 6e67 | 3a70 | 2832 | 2c33 | 2900 |
| 3311600 | 7374 | 7269 | 6e67 | 3a72 | 2832 | 2c33 | 2900 | 6370 | 3a72 | 2832 | 2c33 | 2900 | 736c | 656e | 3a28 | 302c | 3129 | 0067 | 6574 | 7473 | 7472 | 3a46 | 2830 | 2c32 |
| 3311660 | 3129 | 3d2a | 2836 | 2c32 | 3329 | 0067 | 726f | 7570 | 3a70 | 2834 | 2c39 | 2900 | 7374 | 7269 | 6e67 | 3a70 | 2832 | 2c33 | 2900 | 703a | 2830 | 2c32 | 3129 | 0063 |
| 3311740 | 703a | 7228 | 322c | 3329 | 0073 | 697a | 653a | 2830 | 2c31 | 2900 | 7061 | 7273 | 655f | 6d65 | 6d62 | 3a46 | 2832 | 2c33 | 2900 | 7374 | 7261 | 696c | 3a70 | 2830 |
| 3312020 | 2c31 | 3429 | 006c | 6962 | 733a | 7028 | 362c | 3230 | 2900 | 7472 | 6169 | 6c73 | 7472 | 3a70 | 2832 | 2c33 | 2900 | 6d65 | 6d62 | 733a | 2836 | 2c32 | 3229 | 0074 |
| 3312100 | 6d70 | 7472 | 6169 | 6c3a | 2830 | 2c31 | 3429 | 0070 | 6172 | 7365 | 3a28 | 302c | 3231 | 2900 | 7061 | 7273 | 655f | 6f70 | 743a | 4628 | 322c | 3329 | 0073 | 7472 |
| 3312160 | 6169 | 6c3a | 7028 | 302c | 3134 | 2900 | 7472 | 6169 | 6c73 | 7472 | 3a70 | 2832 | 2c33 | 2900 | 6f70 | 743a | 2836 | 2c31 | 3529 | 0070 | 6172 | 7365 | 3a28 | 302c |
| 3312240 | 3231 | 2900 | 7061 | 7273 | 655f | 6669 | 6c65 | 3a46 | 2832 | 2c33 | 2900 | 7374 | 7261 | 696c | 3a70 | 2830 | 2c31 | 3429 | 0074 | 7261 | 696c | 7374 | 723a | 7028 |
| 3312320 | 322c | 3329 | 0066 | 696c | 6573 | 3a28 | 362c | 3137 | 2900 | 746d | 7074 | 7261 | 696c | 3a28 | 302c | 3134 | 2900 | 7061 | 7273 | 653a | 2830 | 2c32 | 3129 | 0070 |
| 3312400 | 6172 | 7365 | 5f6c | 6962 | 3a46 | 2832 | 2c33 | 2900 | 7374 | 7261 | 696c | 3a70 | 2830 | 2c31 | 3429 | 0074 | 7261 | 696c | 7374 | 723a | 7028 | 322c | 3329 | 006c |
| 3312460 | 6962 | 733a | 2836 | 2c32 | 3029 | 0070 | 6172 | 7365 | 3a28 | 302c | 3231 | 2900 | 7061 | 7273 | 655f | 7472 | 6169 | 6c3a | 4628 | 322c | 3329 | 0073 | 7472 | 6169 |
| 3312540 | 6c3a | 7028 | 302c | 3134 | 2900 | 7472 | 6169 | 6c73 | 7472 | 3a70 | 2832 | 2c33 | 2900 | 7472 | 6169 | 6c3a | 2836 | 2c31 | 3629 | 0070 | 6172 | 7365 | 3a28 | 302c |
| 3312620 | 3231 | 2900 | 6578 | 7061 | 6e64 | 7472 | 6169 | 6c3a | 4628 | 302c | 3134 | 2900 | 7472 | 6169 | 6c73 | 7472 | 3a70 | 2832 | 2c33 | 2900 | 7374 | 7261 | 696c | 3a28 |
| 3312700 | 302c | 3134 | 2900 | 746d | 705f | 6772 | 6f75 | 703a | 2834 | 2c39 | 2900 | 6667 | 6574 | 7472 | 6169 | 6c3a | 4628 | 302c | 3134 | 2900 | 6670 | 3a70 | 2836 | 2c33 |
| 3312760 | 2900 | 7374 | 7261 | 696c | 3a28 | 302c | 3134 | 2900 | 7374 | 725f | 6772 | 6f75 | 703a | 2834 | 2c39 | 2900 | 7473 | 7472 | 3a28 | 322c | 3329 | 0063 | 3a28 | 302c |
| 3313040 | 3129 | 0073 | 697a | 653a | 2830 | 2c31 | 2900 | 6669 | 6c65 | 5f61 | 7564 | 6974 | 3a46 | 2830 | 2c31 | 2900 | 6670 | 3a70 | 2836 | 2c33 | 2900 | 6275 | 663a | 2830 |
| 3313120 | 2c32 | 3229 | 3d61 | 7228 | 302c | 3129 | 3b30 | 3b31 | 323b | 2830 | 2c32 | 2900 | 6c6f | 633a | 2830 | 2c31 | 2900 | 633a | 2830 | 2c31 | 2900 | 4e4f | 5459 | 4554 |
| 3313200 | 3a28 | 302c | 3129 | 006d | 6765 | 7474 | 7261 | 696c | 3a46 | 2830 | 2c31 | 3429 | 006d | 703a | 7028 | 362c | 3231 | 2900 | 7374 | 7261 | 696c | 3a28 | 302c | 3134 |
| 3313260 | 2900 | 7374 | 725f | 6772 | 6f75 | 703a | 2834 | 2c39 | 2900 | 7473 | 7472 | 3a28 | 322c | 3329 | 0063 | 3a28 | 302c | 3129 | 0073 | 697a | 653a | 2830 | 2c31 | 2900 |
| 3313340 | 6d65 | 6d62 | 5f70 | 6f73 | 3a46 | 2830 | 2c31 | 2900 | 6170 | 3a70 | 2836 | 2c32 | 3129 | 0068 | 6561 | 6465 | 723a | 7028 | 322c | 3329 | 006c | 656e | 3a70 | 2830 |
| 3313420 | 2c31 | 2900 | 6275 | 663a | 2832 | 2c33 | 2900 | 6c6f | 633a | 2830 | 2c31 | 2900 | 633a | 2830 | 2c31 | 2900 | 7072 | 696e | 7474 | 7261 | 696c | 3a46 | 2830 | 2c31 |
| 3313500 | 2900 | 7374 | 7261 | 696c | 3a70 | 2830 | 2c31 | 3429 | 0074 | 7261 | 696c | 3a28 | 362c | 3136 | 2900 | 6f70 | 7470 | 3a29 | 362c | 3135 | 2900 | 666c | 703a | 2836 |
| 3313560 | 2c31 | 3729 | 006c | 6c70 | 3a28 | 362c | 3230 | 2900 | 6370 | 733a | 2830 | 2c32 | 3329 | 3d2a | 2830 | 2c31 | 3829 | 0076 | 6572 | 3a28 | 322c | 3329 | 006e | 6963 |
| 3313640 | 6564 | 6174 | 653a | 4628 | 322c | 3329 | 0064 | 6174 | 653a | 7028 | 322c | 3329 | 0072 | 6574 | 6461 | 7465 | 3a56 | 2830 | 2c32 | 3429 | 3d61 | 7228 | 302c | 3129 |
| 3313720 | 3b30 | 3b31 | 373b | 2830 | 2c32 | 2900 | 6d6c | 6f70 | 656e | 3a46 | 2836 | 2c32 | 3129 | 006c | 703a | 7028 | 352c | 3529 | 006d | 6e61 | 6d65 | 3a70 | 2832 | 2c33 |
| 3314000 | 2900 | 6d6f | 6465 | 3a70 | 2832 | 2c33 | 2900 | 6d70 | 3a28 | 362c | 3231 | 2900 | 7470 | 3a28 | 362c | 3231 | 2900 | 6d68 | 6973 | 743a | 2830 | 2c31 | 3429 | 0074 |
| 3314060 | 6e61 | 6d65 | 3a28 | 302c | 3235 | 293d | 6172 | 2830 | 2c31 | 293b | 303b | 3235 | 383b | 2830 | 2c32 | 2900 | 6d6c | 636c | 6f73 | 653a | 4628 | 302c | 3129 | 006d |
| 3314140 | 703a | 7028 | 362c | 3231 | 2900 | 6c69 | 6273 | 3a28 | 362c | 3230 | 2900 | 6d65 | 6d62 | 733a | 2836 | 2c32 | 3229 | 0074 | 703a | 2836 | 2c32 | 3129 | 006d | 696e |
| 3314220 | 663a | 2830 | 2c32 | 3029 | 0072 | 633a | 2830 | 2c31 | 2900 | 7472 | 6169 | 6c73 | 7472 | 3a28 | 322c | 3329 | 0074 | 6e61 | 6d65 | 3a28 | 302c | 3235 | 2900 | 6e65 |
| 3314300 | 7874 | 5f73 | 7472 | 3a46 | 2830 | 2c32 | 3329 | 0063 | 703a | 7028 | 322c | 3329 | 0063 | 3a28 | 302c | 3233 | 2900 | 696e | 5f74 | 6f6b | 656e | 3a28 | 302c | 3129 |
| 3314360 | 0074 | 7269 | 6d74 | 7261 | 696c | 3a46 | 2830 | 2c31 | 2900 | 7374 | 7261 | 696c | 3a70 | 2830 | 2c31 | 3429 | 0074 | 7269 | 6d5f | 6772 | 6f75 | 703a | 2834 | 2c39 |
| 3314440 | 2900 | 746c | 6973 | 743a | 2836 | 2c32 | 3629 | 0074 | 703a | 2836 | 2c32 | 3629 | 0074 | 705f | 6869 | 6768 | 6573 | 743a | 2836 | 2c32 | 3629 | 0074 | 7470 | 3a28 |
| 3314520 | 362c | 3236 | 2900 | 6e65 | 7874 | 5f74 | 6c69 | 7374 | 3a46 | 2836 | 2c32 | 3629 | 0074 | 6c69 | 7374 | 3a70 | 2836 | 2c32 | 3629 | 0064 | 6570 | 7468 | 3a70 | 2830 |
| 3314600 | 2c34 | 2900 | 7472 | 696d | 5f67 | 726f | 7570 | 3a70 | 2834 | 2c39 | 2900 | 6e65 | 7774 | 6c69 | 7374 | 3a28 | 362c | 3236 | 2900 | 7470 | 3a28 | 362c | 3236 | 2900 |
| 3314660 | 7265 | 7375 | 6c74 | 5f74 | 6c69 | 7374 | 3a28 | 362c | 3236 | 2900 | 6669 | 6c65 | 733a | 2836 | 2c31 | 3729 | 006c | 6962 | 733a | 2836 | 2c32 | 3029 | 006d | 656d |
| 3314740 | 6273 | 3a28 | 362c | 3232 | 2900 | 7472 | 696d | 5f6c | 6973 | 743a | 4628 | 302c | 3129 | 0074 | 6c69 | 7374 | 3a70 | 2836 | 2c32 | 3629 | 0074 | 7269 | 6d5f | 6772 |
| 3315020 | 6f75 | 703a | 7028 | 342c | 3929 | 0063 | 7572 | 725f | 746c | 6973 | 743a | 2836 | 2c32 | 3629 | 006e | 6577 | 5f74 | 6c69 | 7374 | 3a28 | 362c | 3236 | 2900 | 6c61 |
| 3315100 | 7374 | 7470 | 3a28 | 362c | 3236 | 2900 | 6465 | 7074 | 683a | 2830 | 2c34 | 2900 | 7361 | 6d65 | 7472 | 6169 | 6c3a | 4628 | 302c | 3129 | 0074 | 7231 | 3a70 | 2836 |
| 3315160 | 2c31 | 3629 | 0074 | 7232 | 3a70 | 2836 | 2c31 | 3629 | 006c | 7369 | 6368 | 6b73 | 756d | 3a46 | 2832 | 2c33 | 2900 | 6670 | 3a70 | 2836 | 2c33 | 2900 | 633a | 2830 |
| 3315240 | 2c31 | 2900 | 7331 | 3a28 | 302c | 3129 | 0073 | 323a | 2830 | 2c31 | 2900 | 7333 | 3a28 | 302c | 3129 | 0073 | 756d | 3a28 | 302c | 3129 | 0063 | 686b | 7375 | 6d3a |
| 3315320 | 2830 | 2c32 | 3629 | 3d61 | 7228 | 302c | 3129 | 3b30 | 3b38 | 3b28 | 302c | 3229 | 0066 | 6e61 | 6d65 | 636d | 703a | 6628 | 302c | 3129 | 0070 | 3a70 | 2832 | 2c33 |
| 3315400 | 2900 | 713a | 7028 | 322c | 3329 | 0061 | 7564 | 6669 | 6c65 | 3a46 | 2836 | 2c31 | 3729 | 0068 | 6561 | 643a | 7028 | 362c | 3136 | 2900 | 6e61 | 6d65 | 3a70 | 2832 |
| 3315460 | 2c33 | 2900 | 6464 | 666c | 6167 | 3a70 | 2830 | 2c32 | 2900 | 6669 | 6c65 | 5f69 | 6e66 | 6f3a | 2836 | 2c31 | 3729 | 0066 | 703a | 2836 | 2c33 | 2900 | 6175 | 646c |
| 3315540 | 6962 | 3a46 | 2836 | 2c32 | 3029 | 0069 | 6561 | 643a | 7028 | 362c | 3136 | 2900 | 6e61 | 6d65 | 3a70 | 2832 | 2c33 | 2900 | 6464 | 666c | 6167 | 3a70 | 2830 | 2c32 |
| 3315620 | 2900 | 6c69 | 625f | 696e | 666f | 3a28 | 362c | 3230 | 2900 | 6570 | 3a28 | 362c | 3329 | 0061 | 7564 | 6d65 | 6d62 | 3a46 | 2836 | 2c32 | 3229 | 006c | 6962 | 5f69 |
| 3315700 | 6e66 | 6f3a | 7028 | 362c | 3230 | 2900 | 6e61 | 6d65 | 3a70 | 2832 | 2c33 | 2900 | 6d65 | 6d62 | 5f69 | 6e66 | 6f3a | 2836 | 2c32 | 3229 | 0066 | 6175 | 6464 | 6174 |
| 3315760 | 653a | 4628 | 322c | 3329 | 0066 | 696c | 655f | 696e | 666f | 3a70 | 2836 | 2c31 | 3729 | 006d | 6175 | 6464 | 6174 | 653a | 4628 | 322c | 3329 | 006d | 656d | 625f |
| 3316040 | 696e | 666f | 3a70 | 2836 | 2c32 | 3229 | 0066 | 6175 | 6468 | 6973 | 743a | 4628 | 362c | 3136 | 2900 | 6669 | 6c65 | 5f69 | 6e66 | 6f3a | 7028 | 362c | 3137 | 2900 |
| 3316120 | 6d61 | 7564 | 6869 | 7374 | 3a46 | 2836 | 2c31 | 3629 | 006d | 656d | 625f | 696e | 666f | 3a70 | 2836 | 2c32 | 3229 | 0066 | 6175 | 646e | 616d | 653a | 4628 | 322c |
| 3316200 | 3329 | 0066 | 696c | 655f | 696e | 666f | 3a70 | 2836 | 2c31 | 3729 | 0066 | 696e | 616c | 6175 | 643a | 4628 | 302c | 3129 | 0066 | 6e61 | 6d65 | 3a70 | 2832 | 2c33 |
| 3316260 | 2900 | 6674 | 7970 | 653a | 7028 | 322c | 3329 | 0064 | 6466 | 6c61 | 673a | 7028 | 302c | 3129 | 006c | 6962 | 7074 | 723a | 7028 | 352c | 3529 | 0066 | 703a | 2836 |
| 3316340 | 2c33 | 2900 | 6669 | 6e66 | 3a28 | 302c | 3139 | 2900 | 6e61 | 6d65 | 3a28 | 302c | 3237 | 293d | 6172 | 2830 | 2c31 | 293b | 303b | 3132 | 373b | 2830 | 2c32 | 2900 |
| 3316420 | 636c | 6561 | 6e6e | 616d | 653a | 2830 | 2c32 | 3729 | 0063 | 686b | 7375 | 6d3a | 2830 | 2c32 | 3629 | 0074 | 6572 | 6d3a | 2836 | 2c32 | 3129 | 0069 | 3a28 | 302c |
| 3316500 | 3129 | 0043 | 4c4e | 414d | 453a | 4628 | 322c | 3329 | 0066 | 6e61 | 6d65 | 3a70 | 2832 | 2c33 | 2900 | 6e61 | 6d65 | 3a56 | 2830 | 2c32 | 3729 | 0069 | 3a28 | 302c |

| | | | | | | | | | | | | | | | | | | | | | | | | |
|---|---|---|---|---|---|---|---|---|---|---|---|---|---|---|---|---|---|---|---|---|---|---|---|---|
| 3316560 | 3129 | 0054 | 4e41 | 4345 | 3a46 | 2832 | 2c33 | 2900 | 666e | 616d | 653a | 7028 | 322c | 3329 | 0063 | 6f6c | 6c69 | 7369 | 6f6e | 3a70 | 2830 | 2c31 | 2900 | 6d6e |
| 3316640 | 616d | 653a | 5628 | 302c | 3237 | 2900 | 6861 | 7368 | 6e61 | 6d65 | 3a46 | 2830 | 2c31 | 2900 | 6e61 | 6d65 | 3a70 | 2832 | 2c33 | 2900 | 636f | 6c6c | 6973 | 696f |
| 3316720 | 6e3a | 7028 | 302c | 3129 | 0072 | 6574 | 3a28 | 302c | 3129 | 0065 | 6e64 | 3a28 | 322c | 3329 | 0063 | 6865 | 636b | 5f74 | 6572 | 6d5f | 636f | 6c6c | 6973 | 696f |
| 3317000 | 6e3a | 4628 | 322c | 3329 | 006c | 6962 | 7074 | 723a | 7028 | 352c | 3529 | 006e | 616d | 653a | 7028 | 322c | 3329 | 0063 | 6c65 | 616e | 6e61 | 6d65 | 3a70 | 2832 |
| 3317060 | 2c33 | 2900 | 636f | 6c6c | 6973 | 696f | 6e3a | 2830 | 2c31 | 2900 | 633a | 2830 | 2c31 | 2900 | 693a | 2830 | 2c31 | 2900 | 6f6b | 6e61 | 6d65 | 3a56 | 2830 | 2c32 |
| 3317140 | 3729 | 006d | 656d | 6266 | 6e61 | 6d65 | 3a28 | 302c | 3237 | 2900 | 7465 | 726d | 3a28 | 362c | 3231 | 2900 | 726c | 6f70 | 656e | 3a46 | 2835 | 2c35 | 2900 | 6e61 |
| 3317220 | 6d65 | 3a70 | 2832 | 2c33 | 2900 | 6d6f | 6465 | 3a70 | 2832 | 2c33 | 2900 | 7265 | 766c | 6576 | 656c | 3a70 | 2832 | 2c33 | 2900 | 6c70 | 3a28 | 352c | 3529 | 0072 |
| 3317300 | 6576 | 6d70 | 3a28 | 362c | 3231 | 2900 | 6c69 | 6273 | 3a28 | 362c | 3230 | 2900 | 7361 | 7665 | 6c69 | 623a | 2836 | 2c32 | 3029 | 006d | 696e | 663a | 2830 | 2c32 |
| 3317360 | 3029 | 006c | 696e | 663a | 2830 | 2c31 | 3929 | 0072 | 7670 | 3a28 | 322c | 3329 | 0072 | 6576 | 7472 | 6169 | 6c3a | 4628 | 322c | 3329 | 006c | 703a | 7028 | 352c |
| 3317440 | 3529 | 0067 | 726f | 7570 | 3a70 | 2834 | 2c39 | 2900 | 7265 | 766d | 703a | 2836 | 2c32 | 3129 | 0074 | 6d70 | 6c65 | 7665 | 6c3a | 2830 | 2c32 | 3829 | 3d61 | 7228 |
| 3317520 | 302c | 3129 | 3b30 | 3b37 | 393b | 2830 | 2c32 | 2900 | 7265 | 766c | 6576 | 656c | 3a28 | 322c | 3329 | 0069 | 3a28 | 302c | 3129 | 0063 | 3a28 | 302c | 3129 | 0063 |
| 3317600 | 6872 | 6f6e | 6d65 | 6162 | 3a46 | 2930 | 2c31 | 2900 | 6c70 | 313a | 7028 | 352c | 3529 | 006d | 6e61 | 6d65 | 313a | 7028 | 322c | 3329 | 006c | 7032 | 3a70 | 2835 |
| 3317660 | 2c35 | 2900 | 6d6e | 616d | 6532 | 3a70 | 2832 | 2c33 | 2900 | 6d70 | 313a | 2836 | 2c32 | 3129 | 006d | 7032 | 3a28 | 362c | 3231 | 2900 | 7472 | 6169 | 6c31 | 3a28 |
| 3317740 | 302c | 3134 | 2900 | 7472 | 6169 | 6c32 | 3a28 | 302c | 3134 | 2900 | 746e | 616d | 6531 | 3a28 | 322c | 3329 | 0074 | 6e61 | 6d65 | 323a | 2832 | 2c33 | 2900 | 636f |
| 3320020 | 6d70 | 6172 | 6973 | 6f6e | 3a28 | 302c | 3129 | 006c | 7369 | 7379 | 732e | 6f00 | 5f6c | 7369 | 7379 | 7369 | 6400 | 5f6d | 615f | 6964 | 005f | 6c73 | 6967 | 7061 |
| 3320100 | 6c69 | 6400 | 5f72 | 6373 | 6964 | 002f | 696f | 6d65 | 2f6f | 7361 | 7332 | 2f62 | 2f64 | 6576 | 2f4c | 4942 | 532f | 7265 | 6c31 | 302f | 4c53 | 492f | 7375 | 6e34 |
| 3320160 | 2f00 | 6c73 | 6973 | 7973 | 2e63 | 0069 | 6e74 | 3a74 | 2830 | 2c31 | 293d | 7228 | 302c | 3129 | 3b2d | 3231 | 3437 | 3438 | 3336 | 3438 | 3b32 | 3134 | 3734 | 3833 |
| 3320240 | 3634 | 373b | 0063 | 6861 | 723a | 7428 | 302c | 3229 | 3d72 | 2830 | 2c32 | 293b | 303b | 3132 | 373b | 006c | 6f6e | 673a | 7428 | 302c | 3329 | 3d72 | 2830 | 2c31 |
| 3320320 | 293b | 2d32 | 3134 | 3734 | 3833 | 3634 | 383b | 3231 | 3437 | 3438 | 3336 | 3437 | 3b00 | 7368 | 6f72 | 743a | 7428 | 302c | 3429 | 3d72 | 2830 | 2c31 | 293b | 2d33 |
| 3320400 | 3237 | 3638 | 3b33 | 3237 | 3637 | 3b00 | 756e | 7369 | 676e | 6564 | 2063 | 6861 | 723a | 7428 | 302c | 3529 | 3d72 | 2830 | 2c31 | 293b | 303b | 3235 | 353b | 0075 |
| 3320460 | 6e73 | 6967 | 6e65 | 6420 | 7368 | 6f72 | 743a | 7428 | 302c | 3629 | 3d72 | 2830 | 2c31 | 293b | 303b | 3635 | 3533 | 353b | 0075 | 6e73 | 6967 | 6e65 | 6420 | 6c6f |
| 3320540 | 6e67 | 3a74 | 2830 | 2c37 | 293d | 7228 | 302c | 3129 | 3b30 | 3b2d | 313b | 0075 | 6e73 | 6967 | 6e65 | 6420 | 696e | 743a | 7428 | 302c | 3829 | 3d72 | 2830 | 2c31 |
| 3320620 | 293b | 303b | 2d31 | 3b00 | 666c | 6f61 | 743a | 7428 | 302c | 3929 | 3d72 | 2830 | 2c31 | 293b | 343b | 303b | 0064 | 6f75 | 626c | 653a | 7428 | 302c | 3130 | 293d |
| 3320700 | 7228 | 302c | 3129 | 3b38 | 3b30 | 3b00 | 766f | 6964 | 3a74 | 2830 | 2c31 | 3129 | 3d28 | 302c | 3131 | 2900 | 3f3f | 3f3a | 7428 | 302c | 3132 | 293d | 2830 | 2c31 |
| 3320760 | 2900 | 7263 | 7369 | 643a | 5328 | 302c | 3133 | 293d | 6172 | 2830 | 2c31 | 293b | 303b | 3635 | 3b28 | 302c | 3229 | 002f | 7573 | 722f | 696e | 636c | 7564 | 652f |
| 3321040 | 7374 | 6469 | 6f2e | 6800 | 2e2f | 6c73 | 6973 | 7973 | 2e68 | 002e | 2f6c | 7369 | 7379 | 732e | 6800 | 6c73 | 6973 | 7973 | 6964 | 3a53 | 2832 | 2c31 | 293d | 6172 |
| 3321120 | 2830 | 2c31 | 293b | 303b | 3631 | 3b28 | 302c | 3229 | 0066 | 696c | 6569 | 6e66 | 6f3a | 5428 | 322c | 3229 | 3d73 | 3136 | 756e | 6971 | 7565 | 5f69 | 643a | 2832 |
| 3321200 | 2c33 | 293d | 2a28 | 302c | 3229 | 2c30 | 2c33 | 323b | 666e | 616d | 653a | 2832 | 2c33 | 292c | 3332 | 2c33 | 323b | 7265 | 765f | 6461 | 7465 | 3a28 | 322c | 3329 |
| 3321260 | 2c36 | 342c | 3332 | 3b74 | 6f74 | 616c | 5f62 | 7974 | 6573 | 3a28 | 302c | 3129 | 2c39 | 362c | 3332 | 3b3b | 0046 | 494c | 4549 | 4e46 | 4f3a | 7428 | 322c | 3229 |
| 3321340 | 002e | 2f6c | 7369 | 6770 | 616c | 2e68 | 002e | 2f6c | 7369 | 6770 | 616c | 2e68 | 006c | 7369 | 6770 | 616c | 6964 | 3a53 | 2833 | 2c31 | 293d | 6172 | 2830 | 2c31 |
| 3321420 | 293b | 303b | 3632 | 3b28 | 302c | 3229 | 002f | 7573 | 722f | 6c73 | 692f | 6465 | 762f | 746f | 6f6c | 6c69 | 622f | 696e | 636c | 7564 | 652f | 6d61 | 2e68 | 002f |
| 3321500 | 7573 | 722f | 6c73 | 632f | 6465 | 762f | 746f | 6f6c | 6c69 | 622f | 696e | 636c | 7564 | 652f | 6d61 | 2e68 | 006d | 615f | 6964 | 3a53 | 2834 | 2c31 | 293d | 6172 |
| 3321560 | 2830 | 2c31 | 293b | 303b | 3539 | 3b28 | 302c | 3229 | 0070 | 6f69 | 6e74 | 6572 | 3a74 | 2834 | 2c32 | 293d | 2a28 | 342c | 3329 | 3361 | 7228 | 302c | 3129 | 3b30 |
| 3321640 | 3b30 | 3b28 | 342c | 3429 | 3d61 | 7228 | 302c | 3129 | 3b30 | 3b30 | 3b28 | 342c | 3529 | 3d61 | 7228 | 302c | 3129 | 3b30 | 3b30 | 3b28 | 342c | 3629 | 3d61 | 7228 |
| 3321720 | 302c | 3129 | 3b30 | 3b30 | 3b28 | 342c | 3729 | 3d61 | 7228 | 302c | 3129 | 3b30 | 3b30 | 3b28 | 342c | 3829 | 3d61 | 7228 | 302c | 3129 | 3b30 | 3b30 | 3b28 | 302c |
| 3322000 | 3229 | 0062 | 6f6f | 6c65 | 616e | 3a74 | 2830 | 2c31 | 2900 | 6d61 | 5f67 | 726f | 7570 | 3a74 | 2834 | 2c39 | 293d | 2a28 | 342c | 3130 | 293d | 7334 | 6d61 | 5f67 |
| 3322060 | 726f | 7570 | 3a28 | 302c | 3129 | 2c30 | 2c33 | 323b | 3b00 | 6675 | 6e63 | 7469 | 6f6e | 3a74 | 2834 | 2c31 | 3129 | 3d2a | 2834 | 2c31 | 3229 | 3d66 | 2830 | 2c31 |
| 3322140 | 2900 | 6d65 | 6d5f | 616c | 6c6f | 6361 | 7465 | 643a | 4728 | 302c | 3129 | 006d | 656d | 5f75 | 7365 | 643a | 4728 | 302c | 3129 | 006f | 7574 | 5f6f | 665f | 6d65 |
| 3322220 | 6d6f | 7279 | 5f66 | 756e | 6374 | 696f | 6e3a | 4728 | 342c | 3131 | 2900 | 6973 | 6571 | 7561 | 6c3a | 4628 | 302c | 3129 | 0073 | 313a | 7028 | 322c | 3329 | 0073 |
| 3322300 | 323a | 7028 | 322c | 3329 | 006c | 7369 | 7379 | 732e | 6300 | 7331 | 3a72 | 2832 | 2c33 | 2900 | 7332 | 3a72 | 2832 | 2c33 | 2900 | 636f | 6e73 | 7465 | 713a | 4628 |
| 3322360 | 302c | 3129 | 0073 | 3a70 | 2832 | 2c33 | 2900 | 636f | 6e73 | 743a | 7028 | 322c | 3329 | 0063 | 6f6e | 7374 | 5f6c | 656e | 3a70 | 2830 | 2c31 | 2900 | 733a | 7228 |
| 3322440 | 322c | 3329 | 0063 | 6f6e | 7374 | 3a72 | 2832 | 2c33 | 2900 | 636f | 6e73 | 745f | 6c65 | 6e3a | 7228 | 302c | 3129 | 002f | 7573 | 722f | 696e | 636c | 7564 | 652f |
| 3322520 | 7379 | 732f | 7479 | 7065 | 732e | 6800 | 2f75 | 7372 | 2f69 | 6e63 | 6c75 | 6465 | 2f73 | 7973 | 2f73 | 7973 | 6d61 | 6372 | 6f73 | 2e68 | 0075 | 5f63 | 6861 | 723a |
| 3322600 | 7428 | 302c | 3529 | 0075 | 5f73 | 686f | 7274 | 3a74 | 2830 | 2c36 | 2900 | 755f | 696e | 743a | 7428 | 302c | 3829 | 0075 | 5f6c | 6f6e | 673a | 7428 | 302c | 3829 |
| 3322660 | 0075 | 7368 | 6f72 | 743a | 7428 | 302c | 3629 | 0075 | 696e | 743a | 7428 | 302c | 3829 | 005f | 7068 | 7973 | 6164 | 723a | 5428 | 352c | 3129 | 3d73 | 3472 | 3a28 |
| 3322740 | 352c | 3229 | 3d61 | 7228 | 302c | 3129 | 3b30 | 3b30 | 3b28 | 302c | 3129 | 2c30 | 2c33 | 323b | 3b00 | 7068 | 7973 | 6164 | 723a | 7428 | 352c | 3329 | 3d2a | 2835 |
| 3323020 | 2c31 | 2900 | 6c61 | 6265 | 6c5f | 743a | 5428 | 352c | 3429 | 3d73 | 3876 | 616c | 3a28 | 352c | 3529 | 3d61 | 7228 | 302c | 3129 | 3b30 | 3b31 | 3b28 | 302c | 3129 |
| 3323100 | 2c30 | 2c36 | 343b | 3b00 | 6c61 | 6265 | 6c5f | 743a | 7428 | 352c | 3429 | 005f | 7175 | 6164 | 3a54 | 2835 | 2c36 | 293d | 7338 | 7661 | 6c3a | 2835 | 2c35 | 292c |
| 3323160 | 302c | 3634 | 3b3b | 0071 | 7561 | 643a | 7428 | 352c | 3629 | 0064 | 6164 | 6472 | 5f74 | 3a74 | 2830 | 2c31 | 2900 | 6361 | 6464 | 725f | 743a | 7428 | 322c | 3329 |
| 3323240 | 0069 | 6e6f | 5f74 | 3a74 | 2830 | 2c39 | 2900 | 7377 | 626c | 6b5f | 743a | 7428 | 302c | 3129 | 0073 | 697a | 655f | 743a | 7428 | 302c | 3129 | 0074 | 696d | 655f |
| 3323320 | 743a | 7428 | 302c | 3129 | 0064 | 6576 | 5f74 | 3a74 | 2830 | 2c34 | 2900 | 6f66 | 665f | 743a | 7428 | 302c | 3129 | 0075 | 6964 | 5f74 | 3a74 | 2830 | 2c36 | 2900 |
| 3323400 | 6769 | 645f | 743a | 7428 | 302c | 3629 | 006b | 6579 | 5f74 | 3a74 | 2830 | 2c31 | 2900 | 6664 | 5f6d | 6173 | 6b3a | 7428 | 302c | 3129 | 0066 | 645f | 7365 | 743a |
| 3323460 | 5428 | 352c | 3729 | 3d73 | 3332 | 6664 | 735f | 6269 | 7473 | 3a28 | 352c | 3829 | 3d61 | 7228 | 302c | 3129 | 3b30 | 3b37 | 3b28 | 302c | 3129 | 2c30 | 2c32 | 3536 |
| 3323540 | 3b3b | 0066 | 645f | 7365 | 743a | 7428 | 352c | 3729 | 0061 | 6464 | 725f | 743a | 7428 | 322c | 3329 | 002f | 7573 | 722f | 696e | 636c | 7564 | 652f | 7379 | 732f |
| 3323620 | 7469 | 6d65 | 2e68 | 0074 | 696d | 6576 | 616c | 3a54 | 2837 | 2c31 | 293d | 7338 | 7476 | 5f73 | 6563 | 3a28 | 302c | 3129 | 2c30 | 2c33 | 323b | 7476 | 5f75 | 7365 |

```
3323700 633a 2830 2c31 292c 3332 2c33 323b 3b00 7469 6d65 7a6f 6e65 3a54 2837 2c32 293d 7338 747a 5f6d 696e 7574 6573 7765 7374
3323760 3a28 302c 3129 2c30 2c33 323b 747a 5f64 7374 7469 6d65 3a28 302c 3129 2c33 322c 3332 3b3b 0069 7469 6d65 7276 616c 3a54
3324040 2837 2c33 293d 7331 3669 745f 696e 7465 7276 616c 3a28 372c 3129 2c30 2c36 343b 6974 5f76 616c 7565 3a28 372c 3129 2c36
3324120 342c 3634 3b3b 002f 7573 722f 696e 636c 7564 652f 7469 6d65 2e68 0074 6d3a 5428 382c 3129 3d73 3434 746d 5f73 6563 3a28
3324200 302c 3129 2c30 2c33 323b 746d 5f6d 696e 3a28 302c 3129 2c33 322c 3332 3b74 6d5f 686f 7572 3a28 302c 3129 2c36 342c 3332
3324260 3b74 6d5f 6d64 6179 3a28 302c 3129 2c39 362c 3332 3b74 6d5f 6d6f 6e3a 2830 2c31 292c 3132 382c 3332 3b74 6d5f 7965 6172
3324340 3a28 302c 3129 2c31 3630 2c33 323b 746d 5f77 6461 793a 2830 2c31 292c 3139 322c 3332 3b74 6d5f 7964 6179 3a28 302c 3129
3324420 2c32 3234 2c33 323b 5c00 746d 5f69 7364 7374 3a28 302c 3129 2c32 3536 2c33 323b 746d 5f7a 6f6e 653a 2832 2c33 292c 3238
3324500 382c 3332 3b74 6d5f 676d 746f 6666 3a28 302c 3129 2c33 3230 2c33 323b 3b00 2f75 7372 2f69 6e63 6c75 6465 2f73 7973 2f74
3324560 696d 6573 2e68 0074 6d73 3a54 2839 2c31 2934 7331 3674 6d73 5f75 7469 6d65 3a28 302c 3129 2c30 2c33 323b 746d 735f 7374
3324640 696d 653a 2830 2c31 292c 3332 2c33 323b 746d 735f 6375 7469 6d65 3a28 302c 3129 2c36 342c 3332 3b74 6d73 5f63 7374 696d
3324720 653a 2830 2c31 292c 3936 2c33 323b 3b00 2f75 7372 2f69 6e63 6c75 6465 2f73 7973 2f74 696d 6562 2e68 0074 696d 6562 3a54
3325000 2831 302c 3129 3d73 3132 7469 6d65 3a28 302c 3129 2c30 2c33 323b 6d69 6c6c 6974 6d3a 2830 2c36 292c 3332 2c31 363b 7469
3325060 6d65 7a6f 6e65 3a28 302c 3429 2c34 382c 3136 3b64 7374 666c 6167 3a28 302c 3429 2c36 342c 3136 3b3b 002f 7573 722f 696e
3325140 636c 7564 652f 7379 732f 6669 6c65 2e68 002f 7573 722f 696e 636c 7564 652f 7379 732f 6663 6e74 6c63 6f6d 2e68 0066 6c6f
3325220 636b 3a54 2831 322c 3129 3d73 3136 6c5f 7479 7065 3a28 302c 3429 2c30 2c31 363b 6c5f 7768 656e 6365 3a28 302c 3429 2c31
3325300 362c 3136 3b6c 5f73 7461 7274 3a28 302c 3129 2c33 322c 3332 3b6c 5f6c 656e 3a28 302c 3129 2c36 342c 3332 3b6c 5f70 6964
3325360 3a28 302c 3429 2c39 362c 3136 3b6c 5f78 7878 3a28 302c 3429 2c31 3132 2c31 363b 3b00 2f75 7372 2f69 6e63 6c75 6465 2f73
3325440 7973 2f73 7461 742e 6800 7374 6174 3a54 2831 332c 3129 3d73 3634 7374 5f64 6576 3a28 302c 3429 2c30 2c31 363b 7374 5f69
3325520 6e6f 3a28 302c 3829 2c33 322c 3332 3b73 745f 616f 6465 3a28 302c 3629 2c36 342c 3136 3b73 745f 6e6c 696e 6b3a 2830 2c34
3325600 292c 3830 2c31 363b 7374 5f75 6964 3a28 302c 3429 2c39 362c 3136 3b73 745f 6769 643a 2830 2c34 292c 3131 322c 3136 3b73
3325660 745f 7264 6576 3a28 302c 3429 2c31 3238 2c31 363b 7374 5f73 697a 653a 2830 2c31 292c 3136 302c 3332 3b5c 0073 745f 6174
3325740 696d 653a 2830 2c31 292c 3139 322c 3332 3b73 745f 7370 6172 6531 3a28 302c 3129 2c32 3234 2c33 323b 7374 5f6d 7469 6d65
3326020 3a28 302c 3129 2c32 3536 2c33 323b 7374 5f73 7261 7265 323a 2830 2c31 292c 3238 382c 3332 3b73 745f 6374 696d 653a 2830
3326100 2c31 292c 3332 302c 3332 3b73 745f 7370 6172 6533 3a28 302c 3129 2c33 3532 2c33 323b 7374 5f62 6c6b 7369 7a65 3a28 302c
3326160 3129 2c33 3834 2c33 323b 7374 5f62 6c6f 636b 733a 2830 2c31 292c 3431 362c 3332 3b73 745f 7370 6172 6534 3a28 352c 3529
3326240 2c34 3430 2c36 343b 3b00 6370 7574 696d 3a46 2930 2c31 2900 6370 7574 696d 6573 3a28 392c 3129 0063 7075 7469 6d65 3a28
3326320 302c 3129 0072 6561 6c74 696d 3a46 2830 2c31 2900 7265 616c 7469 6d65 733a 2831 302c 3129 0063 6461 7465 3a46 2832 2c33
3326400 2900 6461 7465 3a28 322c 3329 0074 696d 7661 6c3a 2830 2c31 2900 6e75 6c6c 3a56 2830 2c31 2900 6d72 6461 7465 3a46 2832
3326460 2c33 2900 7265 7375 6c74 3a70 2832 2c33 2900 6974 696d 653a 2830 2c31 2900 7374 696d 653a 2830 2c31 3429 3d2a 2838 2c31
3326540 2900 6669 6e66 6f3a 4628 302c 3135 293d 2a28 322c 3229 006e 616d 653a 7028 322c 3329 006d 6f64 653a 7028 322c 3329 0066
3326620 696c 655f 7074 723a 7028 302c 3136 293d 2a28 312c 3129 0063 656d 5f67 726f 7570 3a70 2834 2c39 2900 6669 6e66 3a28 302c
3326700 3135 2900 6664 3a28 302c 3129 0062 7566 3a28 302c 3137 293d 2a28 3133 2c31 2900 6974 696d 653a 2830 2c31 2900 696e 6f64
3326760 6569 3a28 302c 3129 0073 7469 6465 3a28 302c 3134 2900 7265 765f 6461 7465 3a28 302c 3138 293d 6172 2830 2c31 293b 303b
3327040 3132 3b28 302c 3229 0069 6e6f 6465 3a28 302c 3138 2900 6c62 7566 3a28 302c 3139 293d 6172 2830 2c31 293b 303b 3132 373b
3327120 2830 2c32 2900 6363 3a28 302c 3129 0072 6d5f 6669 6c65 3a46 2830 2c31 2900 6669 6c65 6e61 6d65 3a70 2832 2c33 2900 6670
3327200 3a28 302c 3136 2900 7263 3a28 302c 3129 006c 7369 6464 6e2e 6f00 5f6c 7369 6d61 6369 6400 5f6c 7369 6c69 6269 6400 5f6c
3327260 7369 6465 6669 6400 5f6c 7369 7379 7369 6400 5f6d 615f 6964 005f 6c73 696e 6873 6869 6400 5f6c 7369 6770 616c 6964 005f
3327340 6c73 6963 6f6e 6669 6400 5f72 6373 6964 002f 686f 6d65 2f6f 7361 7332 2f62 2f64 6576 2f4c 4942 532f 7265 6c31 302f 4c53
3327420 492f 7375 6e34 2f00 6c73 6964 646e 2e63 0069 6c74 3a74 2830 2c31 293d 7228 302c 3129 3b2d 3231 3437 3438 3336 3438 3b32
3327500 3134 3734 3833 3634 373b 0063 6861 723a 7428 302c 3229 3d72 2830 2c32 293b 303b 3132 373b 006c 6f6e 673a 7428 302c 3329
3327560 3d72 2830 2c31 293b 2d32 3134 3734 3833 3634 383b 3231 3437 3438 3335 3437 3b00 7368 6f72 743a 7428 302c 3429 3d72 2830
3327640 2c31 293b 2d33 3237 3638 3b33 3237 3637 3b00 756e 7369 676e 6564 2063 6861 723a 7428 302c 3529 3d72 2830 2c31 293b 303b
3327720 3235 353b 0075 6e73 6967 6e65 6420 7368 6f72 743a 7428 302c 3629 3d72 2830 2c31 293b 303b 3635 3533 353b 0075 6e73 6967
3330000 6e65 6420 6c6f 6e67 3a74 2830 2c37 293d 7228 302c 3129 3b30 3b2d 313b 0075 6e73 6967 6e65 6420 696e 743a 7428 302c 3829
3330060 3d72 2830 2c31 293b 303b 2d31 3b00 666c 6f61 743a 7428 302c 3929 3d72 2830 2c31 293b 343b 303b 0064 6f75 626c 653a 7428
3330140 302c 3130 293d 7228 302c 3129 3b38 3b30 3b00 766f 6964 3a74 2830 2c31 3129 3d28 302c 3131 2900 3f3f 3f3a 7428 302c 3132
3330220 293d 2830 2c31 2900 7263 7369 643a 5328 302c 3133 293d 6172 2830 2c31 293b 303b 3632 3b28 302c 3229 002f 7573 722f 696e
3330300 636c 7564 652f 7374 6469 6f2e 6800 2e2f 6c73 6973 7973 2e68 002e 2f6c 7369 7379 732e 6800 6c73 6973 7973 6964 3a53 2832
3330360 2c31 293d 6172 2830 2c31 293b 303b 3631 3b28 302c 3229 0066 696c 6569 6e66 6f3a 5428 322c 3229 3d73 3136 756e 6971 7565
3330440 5f69 643a 2832 2c33 293d 2a28 302c 3229 2c30 2c33 323b 666e 616d 653a 2832 2c33 292c 3332 2c33 323b 7265 765f 6461 7465
3330520 3a28 322c 3329 2c36 342c 3332 3b74 6f74 616c 5f62 7974 6573 3a28 302c 3129 2c39 362c 3332 3b3b 0046 494c 4549 4e46 4f3a
3330600 7428 322c 3229 002e 2f6c 7369 6465 662e 6800 2e2f 6c73 6964 6566 2e68 006c 7369 6465 6669 643a 5328 332c 3129 3d61 7228
3330660 302c 3129 3b30 3b36 303b 2830 2c32 2900 2e2f 6c73 696c 6962 2e68 002e 2f6c 7369 6c69 622e 6800 6c73 696c 6962 6964 3a53
3330740 2834 2c31 293d 6172 2830 2c31 293b 303b 3633 3b28 302c 3229 002e 2f6c 7369 636f 6e66 2e68 002e 2f6c 7369 636f 6e66 2e68
```

| | | | | | | | | | | | | | | | | | | | | | | | | |
|---|---|---|---|---|---|---|---|---|---|---|---|---|---|---|---|---|---|---|---|---|---|---|---|---|
| 3331020 | 006c | 7369 | 636f | 6e66 | 6964 | 3a53 | 2835 | 2c31 | 293d | 6172 | 2830 | 2c31 | 293b | 303b | 3634 | 3b28 | 302c | 3229 | 002e | 2f6c | 7369 | 7479 | 7065 | 2e68 |
| 3331100 | 002e | 2f6c | 7369 | 6770 | 616c | 2e68 | 002e | 2f6c | 7369 | 6770 | 616c | 2e68 | 006c | 7369 | 6770 | 616c | 6964 | 3a53 | 2830 | 2c31 | 3329 | 002f | 7573 | 722f |
| 3331160 | 6c73 | 692f | 6465 | 762f | 746f | 6f6c | 6c69 | 622f | 696e | 636c | 7564 | 652f | 6d61 | 2e68 | 002f | 7573 | 722f | 6c73 | 692f | 6465 | 762f | 746f | 6f6c | 6c69 |
| 3331240 | 622f | 696e | 636c | 7564 | 652f | 6d61 | 2e68 | 006d | 615f | 6964 | 3a53 | 2838 | 2c31 | 2931 | 6172 | 2830 | 2c31 | 293b | 303b | 3539 | 3b28 | 302c | 3229 | 0070 |
| 3331320 | 6f69 | 6e74 | 6572 | 3a74 | 2838 | 2c32 | 293d | 2a28 | 382c | 3329 | 3d61 | 7228 | 302c | 3129 | 3b30 | 3b30 | 3b28 | 382c | 3429 | 3d61 | 7228 | 302c | 3129 | 3b30 |
| 3331400 | 3b30 | 3b28 | 382c | 3529 | 3d61 | 7228 | 302c | 3129 | 3b30 | 3b30 | 3b28 | 382c | 3629 | 3d61 | 7229 | 302c | 3129 | 3b30 | 3b30 | 3b28 | 382c | 3729 | 3d61 | 7228 |
| 3331460 | 302c | 3129 | 3b30 | 3b30 | 3b28 | 382c | 3829 | 3d61 | 7228 | 302c | 3129 | 3b30 | 3b30 | 3b28 | 302c | 3229 | 0062 | 6f6f | 6c65 | 616e | 3a74 | 2830 | 2c31 | 2900 |
| 3331540 | 6d61 | 5f67 | 726f | 7570 | 3a74 | 2838 | 2c39 | 293d | 2a28 | 392c | 3130 | 293d | 7334 | 6d61 | 5f67 | 726f | 7570 | 3a28 | 302c | 3129 | 2c30 | 2c33 | 323b | 3b00 |
| 3331620 | 6675 | 6e63 | 7469 | 6f6e | 3a74 | 2838 | 2c31 | 3129 | 3d2a | 2838 | 2c31 | 3229 | 3d66 | 2830 | 2c31 | 2900 | 6d65 | 6d5f | 616c | 6c6f | 6361 | 7465 | 643a | 4728 |
| 3331700 | 302c | 3129 | 006d | 656d | 5f75 | 7365 | 643a | 4728 | 302c | 3129 | 006f | 7574 | 5f6f | 665f | 6d65 | 6d6f | 7279 | 5f66 | 756e | 6374 | 696f | 6e3a | 4728 | 382c |
| 3331760 | 3131 | 2900 | 2e2f | 6c73 | 696d | 6163 | 2e68 | 002e | 2f6c | 7369 | 6d61 | 632e | 6800 | 6c73 | 696d | 6163 | 6964 | 3a53 | 2834 | 2c31 | 2900 | 2e2f | 6c73 | 6967 |
| 3332040 | 7061 | 6c2e | 6800 | 2e2f | 6c73 | 696e | 6873 | 682e | 6800 | 2e2f | 6c73 | 696e | 6873 | 682e | 6800 | 6c73 | 696e | 6873 | 6869 | 643a | 5328 | 382c | 3129 | 002e |
| 3332120 | 2f6c | 7369 | 6770 | 616c | 2e68 | 002f | 7573 | 722f | 6c73 | 692f | 6465 | 762f | 746f | 6f6c | 6c69 | 622f | 696e | 636c | 7564 | 652f | 6874 | 2e68 | 0068 | 745f |
| 3332200 | 7461 | 626c | 653a | 7428 | 3133 | 2c31 | 293d | 2a28 | 3133 | 2c32 | 293d | 7334 | 6874 | 5f74 | 6162 | 6c65 | 3a28 | 302c | 3129 | 2c30 | 2c33 | 323b | 3b00 | 6861 |
| 3332260 | 7368 | 5f74 | 6162 | 6c65 | 3a74 | 2831 | 332c | 3129 | 0064 | 646e | 616d | 653a | 4629 | 322c | 3329 | 006c | 6f67 | 6963 | 616c | 5f6e | 616d | 653a | 7028 | 322c |
| 3332340 | 3329 | 006c | 7369 | 6464 | 6e2e | 6300 | 6c6f | 6769 | 6361 | 6c3a | 2830 | 2c31 | 3429 | 3d61 | 7228 | 302c | 3129 | 3b30 | 3b31 | 3238 | 3b28 | 302c | 3229 | 0070 |
| 3332420 | 6879 | 7369 | 6361 | 6c3a | 2830 | 2c31 | 3429 | 0062 | 7566 | 3a28 | 302c | 3135 | 293d | 6172 | 2830 | 2c31 | 293b | 303b | 3235 | 353b | 2830 | 2c32 | 2900 | 616c |
| 3332500 | 6c6f | 6361 | 7465 | 645f | 7068 | 7973 | 6963 | 616c | 3a28 | 322c | 3329 | 0064 | 6474 | 6162 | 6c65 | 3a56 | 2831 | 332c | 3129 | 0064 | 6467 | 726f | 7570 | 3a28 |
| 3332560 | 382c | 3929 | 0066 | 703a | 2830 | 2c31 | 3629 | 3d2a | 2831 | 2c31 | 2900 | 6c73 | 696e | 6873 | 682e | 6f00 | 5f6d | 615f | 6964 | 005f | 7263 | 7369 | 6400 | 5f66 |
| 3332640 | 6978 | 5f6b | 6579 | 5f6c | 656e | 6774 | 6800 | 5f66 | 6163 | 746f | 7273 | 002f | 686f | 6d65 | 2f6f | 7361 | 7332 | 2f62 | 2f64 | 6576 | 2f4c | 4942 | 532f | 7265 |
| 3332720 | 6c31 | 302f | 4c53 | 492f | 7375 | 6e34 | 2f00 | 6c73 | 696e | 6873 | 682e | 6300 | 696e | 743a | 7428 | 302c | 3129 | 3d72 | 2830 | 2c31 | 293b | 2d32 | 3134 | 3734 |
| 3333000 | 3833 | 3634 | 383b | 3231 | 3437 | 3438 | 3336 | 3437 | 3b00 | 6368 | 6172 | 3a74 | 2830 | 2c32 | 293d | 7228 | 302c | 3229 | 3b30 | 3b31 | 3237 | 3b00 | 6c6f | 6e67 |
| 3333060 | 3a74 | 2830 | 2c33 | 293d | 7228 | 302c | 3129 | 3b2d | 3231 | 3437 | 3438 | 3336 | 3438 | 3b32 | 3134 | 3734 | 3833 | 3634 | 373b | 0073 | 686f | 7274 | 3a74 | 2830 |
| 3333140 | 2c34 | 293d | 7228 | 302c | 3129 | 3b2d | 3332 | 3736 | 383b | 3332 | 3736 | 373b | 0075 | 6e73 | 6967 | 6e65 | 6420 | 6368 | 6172 | 3a74 | 2830 | 2c35 | 293d | 7228 |
| 3333220 | 302c | 3129 | 3b30 | 3b32 | 3535 | 3b00 | 756e | 7369 | 676e | 6564 | 2073 | 686f | 7274 | 3a74 | 2830 | 2c36 | 293d | 7228 | 302c | 3129 | 3b30 | 3b36 | 3535 | 3335 |
| 3333300 | 3b00 | 756e | 7369 | 676e | 6564 | 206c | 6f6e | 673a | 7428 | 302c | 3729 | 3d72 | 2830 | 2c31 | 293b | 303b | 2d31 | 3b00 | 756e | 7369 | 676e | 6564 | 2069 | 6e74 |
| 3333360 | 3a74 | 2830 | 2c38 | 293d | 7228 | 302c | 3129 | 3b30 | 3b2d | 313b | 0066 | 6c6f | 6174 | 3a74 | 2830 | 2c39 | 293d | 7228 | 302c | 3129 | 3b34 | 3b30 | 3b00 | 646f |
| 3333440 | 7562 | 6c65 | 3a74 | 2830 | 2c31 | 3029 | 3d72 | 2830 | 2c31 | 293b | 383b | 303b | 0076 | 6f69 | 643a | 7428 | 302c | 3131 | 293d | 2830 | 2c31 | 3129 | 003f | 3f3f |
| 3333520 | 3a74 | 2830 | 2c31 | 3229 | 3d28 | 302c | 3129 | 0072 | 6373 | 6964 | 3a53 | 2830 | 2c31 | 3329 | 3d61 | 7228 | 302c | 3129 | 3b30 | 3b36 | 303b | 2830 | 2c32 | 2900 |
| 3333600 | 2f75 | 7372 | 2f6c | 7369 | 2f64 | 6576 | 2f74 | 6f6f | 6c6c | 6962 | 2f69 | 6e63 | 6c75 | 6465 | 2f6d | 612e | 6800 | 2f75 | 7372 | 2f6c | 7369 | 2f64 | 6576 | 2f74 |
| 3333660 | 6f6f | 6c6c | 6962 | 2f69 | 6e63 | 6c75 | 6465 | 2f6d | 612e | 6800 | 6d61 | 5f69 | 643a | 5328 | 312c | 3129 | 3d61 | 7228 | 302c | 3129 | 3b30 | 3b35 | 393b | 2830 |
| 3333740 | 2c32 | 2900 | 706f | 696e | 7465 | 723a | 7428 | 312c | 3229 | 3d2a | 2831 | 2c33 | 293d | 6172 | 2830 | 2c31 | 293b | 303b | 303b | 2831 | 2c34 | 293d | 6172 | 2830 |
| 3334020 | 2c31 | 293b | 303b | 303b | 2831 | 2c35 | 293d | 6172 | 2830 | 2c31 | 293b | 303b | 303b | 2831 | 2c36 | 293d | 6172 | 2830 | 2c31 | 293b | 303b | 303b | 2831 | 2c37 |
| 3334100 | 293d | 6172 | 2830 | 2c31 | 293b | 303b | 303b | 2831 | 2c38 | 293d | 6172 | 2830 | 2c31 | 293b | 303b | 303b | 2830 | 2c32 | 2900 | 626f | 6f6c | 6561 | 6e3a | 7428 |
| 3334160 | 302c | 3129 | 006d | 615f | 6772 | 6f75 | 703a | 7428 | 312c | 3929 | 312a | 2831 | 2c31 | 3029 | 3d73 | 346d | 615f | 6772 | 6f75 | 703a | 2830 | 2c31 | 292c | 302c |
| 3334240 | 3332 | 3b3b | 0066 | 756e | 6374 | 696f | 6e3a | 7428 | 312c | 3131 | 293d | 2a28 | 312c | 3132 | 293d | 6628 | 302c | 3129 | 002f | 7573 | 722f | 6c73 | 692f | 6465 |
| 3334320 | 762f | 746f | 6f6c | 6c69 | 622f | 696e | 636c | 7564 | 652f | 6874 | 2e68 | 0068 | 6173 | 685f | 6661 | 6b65 | 5f73 | 7472 | 7563 | 743a | 5428 | 302c | 3134 | 293d |
| 3334400 | 7338 | 6873 | 6862 | 6c6f | 636b | 3a28 | 302c | 3135 | 293d | 2a28 | 302c | 3229 | 2c30 | 2c33 | 323b | 6c65 | 6e67 | 7468 | 3a28 | 302c | 3129 | 2c33 | 322c | 3332 |
| 3334460 | 3b3b | 0068 | 6173 | 685f | 6661 | 6b65 | 3a74 | 2830 | 2c31 | 3429 | 0066 | 7265 | 6873 | 6862 | 6c6f | 636b | 3a46 | 2830 | 2c31 | 3129 | 0068 | 7368 | 626c | 6f63 |
| 3334540 | 6b3a | 7028 | 302c | 3136 | 293d | 2a28 | 302c | 3134 | 2900 | 6c73 | 696e | 6873 | 682e | 6300 | 6370 | 7968 | 7368 | 626c | 6f63 | 6b3a | 4628 | 312c | 3229 | 0068 |
| 3334620 | 7368 | 626c | 6f63 | 6b3a | 7028 | 302c | 3136 | 2900 | 6e65 | 775f | 6873 | 6862 | 6c6f | 636b | 3a28 | 302c | 3136 | 2900 | 6672 | 6f6d | 3a72 | 2830 | 2c31 | 3529 |
| 3334700 | 0074 | 6f3a | 7228 | 302c | 3135 | 2900 | 693a | 2830 | 2c31 | 2900 | 6e6f | 6672 | 6568 | 7368 | 626c | 6f63 | 6b3a | 4628 | 302c | 3131 | 2900 | 6873 | 6862 | 6c6f |
| 3334760 | 636b | 3a70 | 2830 | 2c31 | 3629 | 006e | 6f63 | 7079 | 6873 | 6862 | 6c6f | 636b | 3a46 | 2831 | 2c32 | 2900 | 6873 | 6862 | 6c6f | 636b | 3a70 | 2830 | 2c31 | 3629 |
| 3335040 | 006e | 6577 | 5f68 | 7368 | 626c | 6f63 | 6b3a | 2830 | 2c31 | 3629 | 0063 | 6d70 | 6873 | 6862 | 6c6f | 636b | 3a46 | 2830 | 2c31 | 2900 | 6873 | 6862 | 6c6f | 636b |
| 3335120 | 313a | 7028 | 302c | 3136 | 2900 | 6873 | 6862 | 6c6f | 636b | 323a | 7028 | 302c | 3136 | 2900 | 7031 | 3a72 | 2830 | 2c31 | 3529 | 0070 | 323a | 7228 | 302c | 3135 |
| 3335200 | 2900 | 693a | 7228 | 302c | 3129 | 0068 | 7368 | 6873 | 6862 | 6c6f | 636b | 3a46 | 2830 | 2c31 | 2900 | 7061 | 7373 | 6564 | 5f68 | 7368 | 626c | 6f63 | 6b3a | 7028 |
| 3335260 | 302c | 3136 | 2900 | 6873 | 6862 | 6c6f | 636b | 3a72 | 2830 | 2c31 | 3529 | 006c | 656e | 6774 | 683a | 7228 | 302c | 3129 | 0072 | 6574 | 3a72 | 2830 | 2c31 | 2900 |
| 3335340 | 6661 | 6374 | 6f72 | 733a | 5328 | 302c | 3137 | 293d | 6172 | 2830 | 2c31 | 293b | 303b | 303b | 2830 | 2c31 | 2900 | 676d | 616b | 6574 | 6162 | 3a46 | 2830 | 2c31 |
| 3335420 | 2900 | 7074 | 6162 | 6c65 | 3a70 | 2830 | 2c31 | 3829 | 3d2a | 2832 | 2c31 | 2900 | 6772 | 6f75 | 703a | 7028 | 312c | 3929 | 0063 | 6f70 | 795f | 6e61 | 6d65 | 3a70 |
| 3335500 | 2830 | 2c31 | 2900 | 6762 | 6d61 | 6b65 | 7461 | 623a | 4628 | 302c | 3129 | 0070 | 7461 | 626c | 653a | 7028 | 302c | 3138 | 2900 | 6272 | 616e | 6368 | 5f66 | 6163 |
| 3335560 | 746f | 725f | 6172 | 7261 | 793a | 7028 | 302c | 3139 | 2931 | 2a28 | 302c | 3129 | 0062 | 7261 | 6e63 | 685f | 6661 | 6374 | 6f72 | 5f61 | 7272 | 6179 | 5f73 | 697a |
| 3335640 | 653a | 7028 | 302c | 3129 | 0067 | 726f | 7570 | 3a70 | 2831 | 2c39 | 2900 | 636f | 7079 | 5f6e | 616d | 653a | 7028 | 302c | 3129 | 0066 | 6978 | 5f6b | 6579 | 5f6c |
| 3335720 | 656e | 6774 | 683a | 6628 | 302c | 3129 | 006b | 6579 | 3a70 | 2831 | 2c32 | 2900 | 6c65 | 6e67 | 7468 | 3a70 | 2830 | 2c31 | 2900 | 6768 | 6173 | 6869 | 6e73 | 6572 |
| 3336000 | 743a | 4628 | 302c | 3129 | 0070 | 7472 | 3a70 | 2831 | 2c32 | 2900 | 7461 | 626c | 653a | 7028 | 322c | 3129 | 006b | 6579 | 3a70 | 2831 | 2c32 | 2900 | 6b65 | 795f |
| 3336060 | 6c65 | 6e67 | 7468 | 3a70 | 2830 | 2c31 | 2900 | 6873 | 6862 | 6c6f | 636b | 3a28 | 302c | 3134 | 2900 | 6768 | 6173 | 6867 | 6574 | 3a46 | 2830 | 2c31 | 2900 | 7070 |

```
3336140  7472 3a70 2830 2c32 3029 3d2a 2831 2c32 2900 7461 626c 653a 7028 322c 3129 006b 6579 3a70 2831 2c32 2900 6b65 795f 6c65
3336220  6e67 7468 3a70 2330 2c31 2900 6873 6862 6c6f 636b 3a28 302c 3134 2900 6768 6173 6864 656c 6574 653a 4628 302c 3129 0074
3336300  6162 6c65 3a70 2832 2c31 2900 6b65 793a 7028 312c 3229 006b 6579 5f6c 656e 6774 683a 7028 302c 3129 0068 7368 626c 6f63
3336360  6b3a 2830 2c31 3429 0067 6861 7368 6163 743a 4628 302c 3129 0074 6162 6c65 3a70 2832 2c31 2900 726f 7574 696e 653a 7028
3336440  312c 3131 2900 6873 6862 6c6f 636b 3a28 302c 3136 2900 6461 7461 3a28 312c 3229 0070 7265 7669 6f75 733a 2831 2c32 2900
3336520  6768 6173 6861 6e61 6c79 7a65 3a46 2830 2c31 2900 7461 626c 653a 7028 322c 3129 0073 6d61 6b65 7461 623a 4628 302c 3129
3336600  0070 7461 626c 653a 7028 302c 3138 2900 6772 6f75 703a 7028 312c 3929 0063 6f70 795f 6e61 6d65 3a70 2830 2c31 2900 7362
3336660  6d61 6b65 7461 623a 4628 302c 3129 0070 7461 626c 653a 7028 302c 3138 2900 6272 616e 6368 5f66 6163 746f 725f 6172 7261
3336740  793a 7028 302c 3139 2900 6272 616e 6368 5f66 6163 746f 725f 6172 7261 795f 7369 7a65 3a70 2830 2c31 2900 6772 6f75 703a
3337020  7028 312c 3929 0063 6f70 795f 6e61 6d65 3a70 2830 2c31 2900 7368 6173 6869 6e73 6572 743a 4628 302c 3129 0070 7472 3a70
3337100  2831 2c32 2900 7461 626c 653a 7028 322c 3129 006b 6579 3a70 2830 2c31 3529 006b 6579 5f6c 656e 6774 683a 7028 302c 3129
3337160  0073 6861 7368 6765 743a 4628 302c 3129 0070 7074 723a 7028 302c 3230 2900 7461 626c 653a 7028 322c 3129 006b 6579 3a70
3337240  2830 2c31 3529 006b 6579 5f6c 656e 6774 683a 7028 302c 3129 0073 6861 7368 6465 6c65 7465 3a46 2830 2c31 2900 7461 626c
3337320  653a 7028 322c 3129 006b 6579 3a70 2830 2c31 3529 006b 6579 5f6c 656e 6774 683a 7028 302c 3129 0073 6861 7368 6163 743a
3337400  4628 302c 3129 0074 6162 6c65 3a70 2832 2c31 2900 726f 7574 696e 653a 7028 312c 3131 2900 7368 6173 6861 6e61 6c79 7a65
3337460  3a46 2830 2c31 2900 7461 626c 653a 7028 322c 3129 0070 6d61 6b65 7461 623a 4628 302c 3129 0070 7461 626c 653a 7028 302c
3337540  3138 2900 6772 6f75 703a 7028 312c 3929 0073 626d 616b 6574 6162 3a46 2830 2c31 2900 7074 6162 6c65 3a70 2830 2c31 3829
3337620  0062 7261 6e63 685f 6661 6374 6f72 5f61 7272 6179 3a70 2830 2c31 3929 0062 7261 6e63 685f 6661 6374 6f72 5f61 7272 6179
3337700  5f73 697a 653a 7028 302c 3129 0067 726f 7570 3a70 2831 2c39 2900 7068 6173 6869 6e73 6572 743a 4628 302c 3129 0070 7472
3337760  3a70 2831 2c32 2900 7461 626c 653a 7028 322c 3129 006b 6579 3a70 2831 2c32 2900 7068 6173 6867 6574 3a46 2830 2c31 2900
3340040  7070 7472 3a70 2830 2c32 3029 0074 6162 6c65 3a70 2832 2c31 2900 6b65 793a 7028 312c 3229 0070 6861 7368 6465 6c65 7465
3340120  3a46 2830 2c31 2900 7461 626c 653a 7028 322c 3129 006b 6579 3a70 2831 2c32 2900 7068 6173 6861 6374 3a46 2830 2c31 3129
3340200  0074 6162 6c65 3a70 2832 2c31 2900 726f 7574 696e 653a 7028 312c 3131 2900 6b65 793a 2831 2c32 2900 6461 7461 3a28 312c
3340260  3229 0070 7265 7669 6f75 733a 2831 2c32 2900 7068 6173 6861 6e61 6c79 7a65 3a46 2830 2c31 3129 0074 6162 6c65 3a70 2832
3340340  2c31 2900 6c73 696c 6962 2e6f 005f 6c6f 6164 7365 7100 5f73 6561 7263 6862 7974 6500 5f62 7569 6c64 6c69 6200 5f6d 6169
3340420  6e6c 6962 005f 7472 6163 6563 6f75 6e74 005f 6475 6d70 6669 6c65 005f 6462 5f62 7974 6573 005f 6663 6f6e 7461 6374 005f
3340500  6765 7473 6e65 616b 005f 6372 6561 7465 6469 7265 6e74 005f 6275 6767 7000 5f69 6e63 6f6d 7061 7400 5f65 7870 616e 6462
3340560  6974 6d61 7000 5f63 6b73 756d 005f 7772 6974 6564 6972 6563 746f 7279 005f 7265 6164 5f72 6563 6f72 6400 5f72 6561 645f
3340640  6865 6164 6572 005f 6c69 6264 6566 6964 005f 6c73 6973 7973 6964 005f 6c69 6269 6e74 6964 005f 6c69 6261 626f 7274 005f
3340720  7761 7463 6869 7400 5f73 6565 6b5f 7265 636f 7264 005f 6275 696c 645f 7665 7200 5f63 6169 6e67 6174 6500 5f74 616b 655f
3341000  7265 636f 7264 005f 7472 616e 5f72 6563 6f72 6400 5f64 756d 706d 6e61 6d65 005f 6465 6275 6767 696e 6700 5f65 7874 7261
3341060  696e 666f 005f 7068 7973 6f70 656e 005f 7772 6974 655f 626c 6f63 6b00 5f77 7269 7465 6269 746d 6170 005f 666c 6962 7472
3341140  6163 6500 5f67 6574 5f66 6d6f 6465 005f 6372 6561 7465 5f68 6561 6465 7200 5f63 7674 5f6e 6577 6865 6164 6572 005f 6368
3341220  6563 6b5f 7265 636f 7264 7300 5f73 636f 6e74 6163 7400 5f6f 6c64 7665 7273 7472 696e 6700 5f6d 615f 6964 005f 696e 6e65
3341300  7267 6174 6500 5f69 6e69 745f 6c69 6273 005f 6475 6d70 6974 005f 6c69 6269 6e69 7465 6400 5f6c 7369 6e68 7368 6964 005f
3341360  6c73 6967 7061 6c69 6400 5f6c 6962 5f61 7272 6179 005f 6370 7574 635f 656f 7200 5f6d 656d 6265 7272 6f72 005f 6d67 6574
3341440  635f 656f 7200 5f6d 6c63 6f6d 7061 6374 005f 6475 6d70 6d65 6d62 6572 005f 7772 6974 655f 7265 636f 7264 005f 6f70 656e
3341520  5f6c 6962 5f6c 6973 7400 5f62 6374 6d61 736b 005f 6d66 6c75 7368 005f 6469 7273 6565 6b00 5f64 625f 7265 6373 005f 7665
3341600  726e 756d 6265 7200 5f65 7072 696e 7466 005f 7265 6164 6469 7265 6374 6f72 7900 5f67 6574 6465 6d62 005f 6472 6f70 5f72
3341660  6563 6f72 6400 5f64 726f 705f 6d65 6d62 6572 005f 6578 7465 6e64 5f66 696c 6500 2f68 6f6d 652f 6f73 6173 322f 622f 6465
3341740  762f 4c49 4253 2f72 656c 3133 2f4c 5349 2f73 756e 342f 006c 7369 6c69 622e 6300 696e 743a 7428 302c 3129 3d72 2830 2c31
3342020  293b 2d32 3134 3734 3833 3634 383b 3231 3437 3438 3336 3437 3b00 6368 6172 3a74 2830 2c32 293d 7228 302c 3229 3b30 3b31
3342100  3237 3b00 6c6f 6e67 3a74 2830 2c33 293d 7228 302c 3129 3b2d 3231 3437 3438 3336 3438 3b32 3134 3734 3833 3634 373b 0073
3342160  686f 7274 3a74 2830 2c34 293d 7228 302c 3129 3b2d 3332 3736 383b 3332 3736 373b 0075 6e73 6967 6e65 6420 6368 6172 3a74
3342240  2830 2c35 293d 7228 302c 3129 3b30 3b32 3535 3b00 756e 7369 676e 6564 2073 686f 7274 3a74 2830 2c36 293d 7228 302c 3129
3342320  3b30 3b36 3535 3335 3b00 756e 7369 676e 6564 206c 6f6e 673a 7428 302c 3729 3d72 2830 2c31 293b 303b 2d31 3b00 756e 7369
3342400  676e 6564 2069 6e74 3a74 2830 2c38 293d 7228 302c 3129 3b30 3b2d 313b 0066 6c6f 6174 3a74 2830 2c39 293d 7228 302c 3129
3342460  3b34 3b30 3b00 646f 7562 6c65 3a74 2830 2c31 3029 3d72 2830 2c31 293b 383b 303b 0076 6f69 643a 7428 302c 3131 293d 2830
3342540  2c31 3129 003f 3f3f 3a74 2830 2c31 3229 3d28 302c 3129 006c 6962 696e 7469 643a 5328 302c 3133 293d 6172 2830 2c31 293b
3342620  303b 3530 3b28 302c 3229 002f 7573 722f 696e 636c 7564 652f 7374 6469 6f2e 6800 2e2f 6c73 6973 7973 2e68 002e 2f6c 7369
3342700  7379 732e 6800 6c73 6973 7973 6964 3a53 2832 2c31 293d 6172 2830 2c31 293b 303b 3631 3b28 302c 3229 0066 696c 6569 6e66
3342760  6f3a 5428 322c 3229 3d73 3136 756e 6971 7565 5f69 643a 2832 2c33 293d 2a28 302c 3229 2c30 2c33 323b 666e 616d 653a 2832
3343040  2c33 292c 3332 2c33 323b 7265 765f 6461 7465 3a28 322c 3329 2c36 342c 3332 3b74 6f74 616c 5f62 7974 6573 3a28 302c 3129
3343120  2c39 362c 3332 3b3b 0046 494c 4549 4e46 4f3a 7428 322c 3229 002e 2f6c 7369 6770 616c 2e68 002e 2f6c 7369 6770 616c 2e68
3343200  006c 7369 6770 616c 6964 3a53 2833 2c31 293d 6172 2830 2c31 293b 303b 3632 3b28 302c 3229 002f 7573 722f 6c73 692f 6465
```

```
3343260  762f 746f 6f6c 6c69 622f 696e 636c 7564 652f 6d61 2e68 002f 7573 722f 6c73 692f 6465 762f 746f 6f6c 6c69 622f 696e 636c
3343340  7564 652f 6d61 2e68 006d 615f 6964 3a53 2834 2c31 293d 6172 2830 2c31 293b 303b 3539 3b28 302c 3229 0070 6f69 6e74 6572
3343420  3a74 2834 2c32 293d 2a28 342c 3329 3d61 7228 302c 3129 3b30 3b30 3b28 342c 3429 3d61 7228 302c 3129 3b30 3b30 3b28 342c
3343500  3529 3d61 7228 302c 3129 3b30 3b30 3b28 342c 3629 3d61 7228 302c 3129 3b30 3b30 3b28 342c 3729 3d61 7228 302c 3129 3b30
3343560  3b30 3b28 342c 3829 3d61 7228 302c 3129 3b30 3b30 3b28 302c 3229 0062 6f6f 6c65 616e 3a74 2830 2c31 2900 6d61 5f67 726f
3343640  7570 3a74 2834 2c39 293d 2a28 342c 3130 293d 7334 6d61 5f67 726f 7570 3a28 302c 3129 2c30 2c33 323b 3b00 6675 6e63 7469
3343720  6f6e 3a74 2834 2c31 3129 3d2a 2834 2c31 3229 3166 2830 2c31 2900 6d65 6d5f 616c 6c6f 6361 7465 643a 4728 302c 3129 006d
3344000  656d 5f75 7365 643a 4728 302c 3129 006f 7574 5f6f 665f 6d65 6d6f 7279 5f66 756e 6374 696f 6e3a 4728 342c 3131 2900 2e2f
3344060  6c73 696e 6873 682e 6800 2e2f 6c73 696e 6873 682e 6800 6c73 696e 6873 6869 643a 5328 342c 3129 002e 2f6c 7369 6770 616c
3344140  2e68 002f 7573 722f 6c73 692f 6465 762f 746f 6f6c 6c69 622f 696e 636c 7564 652f 6874 2e68 0068 6173 685f 7461 626c 653a
3344220  7428 372c 3129 002e 2f6c 6962 6465 662e 6800 2e2f 6c69 6264 6566 2e68 006c 6962 6455 6669 643a 5328 332c 3129 0075 7365
3344300  726c 6962 3a54 2838 2c31 293d 7334 785f 6c69 6272 6172 793a 2830 2c31 292c 302c 3332 3b3b 004c 4942 5241 5259 3a74 2838
3344360  2c31 2900 7573 6572 6d65 6d62 3a54 2838 2c32 293d 7334 785f 6d65 6d62 6572 3a28 302c 3129 2c30 2c33 323b 3b00 4d45 4d42
3344440  4552 3a74 2838 2c32 2900 7573 6572 6c65 6e74 3a54 2838 2c33 293d 7333 6d6e 616d 653a 2832 2c33 292c 302c 3332 3b6d 7369
3344520  7a65 3a28 302c 3129 2c33 322c 3332 3b3b 004c 4942 4e41 4d3a 7428 382c 3329 0075 7365 726d 696e 666f 3a54 2838 2c34 293d
3344600  7332 306c 703a 2838 2c35 293d 2a28 382c 3129 2c30 2c33 323b 6c6e 6161 653a 2832 2c33 292c 3332 2c33 323b 6d6e 616d 653a
3344660  2832 2c33 292c 3634 2c33 323b 6473 697a 653a 2830 2c31 292c 3936 2c33 323b 7277 613a 2830 2c32 292c 3132 382c 383b 7061
3344740  6431 3a28 302c 3229 2c31 3336 2c38 3b70 6164 323a 2830 2c32 292c 3134 342c 383b 7061 6433 3a28 302c 3229 2c31 3532 2c38
3345020  3b3b 004d 454d 4249 4e46 4f3a 7428 382c 3429 006c 6962 7472 6f6e 3a47 2830 2c31 2900 6c69 6272 6561 736f 6e3a 4728 302c
3345100  3129 006c 6962 6372 7970 743a 4728 302c 3129 006c 6962 636f 6d70 6174 3a47 2830 2c31 2900 4f4c 4448 4541 4445 523a 7428
3345160  302c 3134 293d 7334 3876 6572 7369 6f6e 3a28 302c 3135 293d 6172 2830 2c31 293b 303b 3135 3b28 302c 3229 2c30 2c31 3238
3345240  3b77 6869 6368 6865 6164 3a28 302c 3229 2c31 3238 2c38 3b6e 756d 6f66 7265 6373 3a28 302c 3129 2c31 3630 2c33 323b 6470
3345320  3a28 302c 3129 2c31 3932 2c33 323b 626d 703a 2830 2c31 292c 3232 342c 3332 3b64 7369 7a65 3a28 302c 3129 2c32 3536 2c33
3345400  323b 626d 7369 7a65 3a28 302c 3429 2c32 3838 2c31 363b 736f 7274 6564 3a28 302c 3429 2c33 3034 2c31 363b 5c00 6675 7475
3345460  7265 313a 2830 2c31 292c 3332 302c 3332 3b66 7574 7572 6532 3a28 302c 3129 2c33 3532 2c33 323b 3b00 4845 4144 4552 3a74
3345540  2830 2c31 3629 3373 3532 7665 7273 696f 6e3a 2830 2c31 3529 2c30 2c31 3238 3b77 6869 6368 6865 6164 3a28 302c 3229 2c31
3345620  3238 2c39 3b66 7470 313a 2830 2c32 292c 3133 362c 383b 6674 7032 3a28 302c 3229 2c31 3434 2c38 3b70 6164 313a 2830 2c32
3345700  292c 3135 322c 383b 6e75 6d6f 6672 6563 733a 2830 2c31 292c 3136 302c 3332 3b64 703a 2830 2c31 292c 3139 322c 3332 3b62
3345760  6470 3a28 302c 3129 2c32 3234 2c33 323b 5c00 6473 697a 653a 2830 2c31 292c 3235 362c 3332 3b62 6d73 697a 653a 2830 2c31
3346040  292c 3238 382c 3332 3b73 6f72 7465 643a 2830 2c31 292c 3332 302c 3332 3b66 7574 7572 6531 3a28 302c 3129 2c33 3532 2c33
3346120  323b 6675 7475 7265 323a 2830 2c31 292c 3338 342c 3332 3b3b 004d 454d 423a 7428 302c 3139 293d 7335 3332 6c70 3a28 302c
3346200  3230 293d 2a28 302c 3137 293d 7873 6c69 625f 7374 7275 6374 3a2c 302c 3332 3b64 703a 2830 2c32 3129 3d2a 2830 2c31 3829
3346260  3d78 7364 6972 6d65 6d62 5f73 7472 7563 743a 2c33 322c 3332 3b63 7572 7265 633a 2830 2c31 292c 3634 2c33 323b 6e65 7874
3346340  6279 7465 3a28 322c 3329 2c39 362c 3332 3b72 6563 6c65 6674 3a28 302c 3429 2c31 3238 2c31 363b 6d6f 6465 3a28 302c 3229
3346420  2c31 3434 2c38 3b70 6164 313a 2830 2c32 292c 3135 322c 383b 6e65 7874 7265 633a 2830 2c31 292c 3136 302c 3332 3b63 6f6e
3346500  7465 6e74 733a 2830 2c32 3229 3161 7228 302c 3129 3b30 3b35 3337 3b28 302c 3229 2c31 3932 2c34 3036 343b 3b00 4449 5245
3346560  4e54 3a74 2830 2c32 3329 3d73 3438 6672 6f6e 7472 6563 3a28 302c 3129 2c30 2c33 323b 6261 636b 7265 633a 2830 2c31 292c
3346640  3332 2c33 323b 6461 7465 3a28 302c 3135 292c 3634 2c31 3238 3b63 6f64 653a 2830 2c32 292c 3139 322c 383b 6b65 7931 3a28
3346720  302c 3229 2c32 3030 2c38 3b6b 6579 323a 2830 2c32 292c 3230 382c 383b 6b65 7933 3a28 302c 3229 2c32 3136 2c38 3b66 7574
3347000  7572 6532 3a28 302c 3129 2c32 3234 2c33 323b 5c00 6675 7475 7265 333a 2830 2c31 292c 3235 362c 3332 3b66 7574 7572 6534
3347060  3a28 302c 3129 2c32 3838 2c33 323b 6c65 6e67 7468 3a28 302c 3129 2c33 3230 2c33 323b 6d65 6d62 6572 6e61 6d65 3a28 302c
3347140  3234 293d 6172 2830 2c31 293b 303b 333b 2830 2c32 292c 3335 322c 3332 3b3b 0064 6972 6d65 6d62 5f73 7472 7563 743a 5428
3347220  302c 3138 293d 7331 3263 6861 696e 3a28 302c 3235 293d 2a28 302c 3138 292c 302c 3332 3b64 656e 743a 2830 2c32 3629 3d2a
3347300  2830 2c32 3329 2c33 322c 3332 3b6f 7065 6e6d 6563 3a28 302c 3237 293d 2a28 302c 3139 292c 3634 2c33 323b 3b00 4449 524d
3347360  454d 423a 7428 302c 3138 2900 6c69 625f 7374 7275 6374 3a54 2830 2c31 3729 3d73 3132 3463 6861 696e 3a28 302c 3238 293d
3347440  2a28 302c 3137 292c 302c 3332 3b6e 616d 653a 2832 2c33 292c 3332 2c33 323b 6772 6f75 703a 2834 2c39 292c 3634 2c33 323b
3347520  6670 3a28 302c 3239 293d 2a28 312c 3129 2c39 362c 3332 3b68 6561 6465 723a 2830 2c31 3629 2c31 3238 2c34 3136 3b64 6972
3347600  6563 743a 2837 2c31 292c 3534 342c 3332 3b6d 656d 626c 6973 743a 2830 2c32 3529 2c35 3736 2c33 323b 6c61 7374 7365 656e
3347660  3a28 302c 3235 292c 3630 382c 3332 3b5c 006e 756d 6f66 7265 6373 3a28 302c 3129 2c36 3430 2c33 323b 7265 6373 696e 6669
3347740  6c65 3a28 302c 3129 2c36 3732 2c33 323b 6f6c 6462 6974 6d61 703a 2832 2c33 292c 3730 342c 3332 3b6e 6577 6269 746d 6170
3350020  3a28 322c 3329 2c37 3336 2c33 323b 7061 6765 7461 623a 2837 2c31 292c 3736 382c 3332 3b6d 6170 7369 7a65 3a28 302c 3129
3350100  2c38 3030 2c33 323b 6f6c 6472 6563 733a 2830 2c31 292c 3833 322c 3332 3b73 6561 7263 6870 6f73 3a28 302c 3129 2c38 3634
3350160  2c33 323b 5c00 6672 6565 6c69 7374 3a28 302c 3237 292c 3839 362c 3332 3b72 6566 636f 756e 743a 2830 2c34 292c 3932 382c
3350240  3136 3b70 6164 313a 2830 2c34 292c 3934 342c 3136 3b63 6861 6e67 6564 3a28 302c 3229 2c39 3630 2c38 3b77 7269 7461 626c
3350320  653a 2830 2c32 292c 3936 382c 383b 636f 6d70 6163 743a 2830 2c32 292c 3937 362c 383b 6d75 6c74 696d 6f64 653a 2830 2c32
```

```
3350400 292c 3938 342c 383b 3b00 4c49 423a 7428 302c 3137 2900 666f 705f 7069 643a 4728 322c 3329 006c 7369 6c69 622e 6300 6663
3350460 6f6e 7461 6374 3a53 2830 2c33 3029 3d61 7228 302c 3129 3b30 3b32 313b 2830 2c32 2900 7363 6f6e 7461 6374 3a53 2830 2c33
3350540 3129 3d61 7228 302c 3129 3b30 3b32 3b28 302c 3229 006f 6c64 7665 7273 7472 696e 673a 5328 302c 3332 293d 6172 2830 2c31
3350620 293b 303b 3133 3b28 302c 3229 0076 6572 6e75 6d62 6572 3a53 2830 2c31 2900 6269 746d 6173 6b3a 5328 302c 3333 293d 6172
3350700 2830 2c31 293b 303b 373b 2830 2c32 2900 6f70 656e 5f6c 6962 5f6c 6973 743a 5328 302c 3238 2900 6475 6d70 6d65 6d62 6572
3350760 3a53 2830 2c32 3729 0064 756d 7066 696c 653a 5328 302c 3239 2900 6475 6d70 6d6e 616d 653a 5328 322c 3329 006d 6169 6e67
3351040 6174 653a 5328 322c 3329 006d 6169 6e6c 6962 3a53 2830 2c32 3829 0069 6e6e 6572 6761 7465 3a53 2832 2c33 2900 6578 7472
3351120 6169 6e66 6f3a 5328 322c 3329 006c 6962 5f61 7272 6179 3a53 2830 2c33 3429 3d61 7228 302c 3129 3b30 3b34 393b 2838 2c35
3351200 2900 6c69 6269 6e69 7465 643a 5328 302c 3129 0064 6562 7567 6769 6e67 3a53 2830 2c31 2900 6475 6d70 6974 3a53 2830 2c31
3351260 2900 7761 7463 6869 743a 5328 302c 3129 0063 6865 636b 5f72 6563 6f72 6473 3a53 2830 2c31 2900 6275 6767 703a 5328 342c
3351340 3929 0064 625f 6279 7465 733a 5328 302c 3129 0064 625f 7265 6373 3a53 2830 2c31 2900 7472 6163 6563 6f75 6e74 3a53 2830
3351420 2c31 2900 636b 7375 6d3a 5328 302c 3129 0066 705f 6578 7065 6374 6564 3a47 2830 2c32 3929 0066 705f 6163 7475 616c 3a47
3351500 2830 2c32 3929 0073 6565 6b5f 7265 636f 7264 3a66 2830 2c31 2900 6c70 3a70 2830 2c32 3829 0072 6563 6e75 6d3a 7028 302c
3351560 3129 0066 703a 2830 2c32 3929 0072 6561 645f 7265 636f 7264 3a66 2830 2c31 2900 6c70 3a70 2830 2c32 3829 0062 7566 3a70
3351640 2832 2c33 2900 6670 3a72 2830 2c32 3929 0069 3a72 2830 2c31 2900 7074 723a 7228 322c 3329 0063 3a28 302c 3129 0065 7874
3351720 656e 645f 6669 6c65 3a66 2830 2c31 2900 6670 3a70 2830 2c32 3929 006e 3a70 2830 2c31 2900 7772 6974 655f 7265 636f 7264
3352000 3a66 2830 2c31 2900 6c70 3a70 2830 2c32 3829 0072 6563 6e75 6d3a 7029 302c 3129 0062 7566 3a70 2832 2c33 2900 6570 3a72
3352060 2830 2c32 3929 0069 3a72 2830 2c31 2900 7074 723a 7228 322c 3329 0074 7261 6e5f 7265 636f 7264 3a66 2830 2c31 2900 6465
3352140 6e74 3a70 2830 2c32 3629 0063 703a 7028 322c 3329 0065 6e63 6f64 696e 673a 7028 302c 3129 0063 703a 7228 322c 3329 0069
3352220 3a72 2830 2c31 2900 6465 6c74 613a 7228 302c 3129 0077 7269 7465 5f62 6c6f 636b 3a66 2830 2c31 2900 6461 7461 3a70 2832
3352300 2c33 2900 6c65 6e3a 7028 302c 3129 0066 703a 7028 302c 3239 2900 6461 7461 3a72 2832 2c33 2900 6c65 6e3a 7228 302c 3129
3352360 0066 703a 7228 302c 3239 2900 696e 636f 6d70 6174 3a66 2830 2c31 2900 733a 7028 322c 3329 006e 756d 3a28 302c 3129 0074
3352440 6578 743a 2830 2c31 3529 0062 7569 6c64 5f76 6572 3a66 2830 2c31 2900 7465 7874 3a70 2832 2c33 2900 6376 745f 6e65 7768
3352520 6561 6465 723a 6628 302c 3129 0068 6561 643a 7028 302c 3335 293d 2a28 302c 3136 2900 6f6c 643a 2830 2c33 3629 3d2a 2830
3352600 2c31 3429 0072 6561 645f 6865 6164 6572 3a66 2830 2c31 2900 6c70 3a70 2830 2c32 3829 0066 703a 2830 2c32 3929 0068 6561
3352660 643a 2830 2c33 3529 0068 6561 6470 3a28 322c 3329 0069 3a28 302c 3129 0063 3a28 302c 3129 0063 7265 6174 655f 6865 6164
3352740 6572 3a66 2830 2c31 2900 6c70 3a70 2830 2c32 3829 0068 6561 643a 2830 2c33 3529 0074 616b 655f 7265 636f 7264 3a66 2830
3353020 2c31 2900 6c70 3a70 2830 2c32 3929 0074 6172 6774 6279 743a 2930 2c32 2900 7461 7267 7462 6974 3a28 302c 3129 0069 3a28
3353100 302c 3129 006f 6c64 6279 7465 733a 2830 2c31 2900 6269 7469 6e64 6578 3a28 302c 3129 0064 726f 705f 7265 636f 7264 3a66
3353160 2830 2c31 2900 6c70 3a70 2830 2c32 3829 0072 6563 696e 6465 783a 7028 302c 3129 0074 6172 6774 6269 743a 2830 2c31 2900
3353240 693a 2830 2c31 2900 7365 6172 6368 6279 7465 3a66 2830 2c31 2900 7468 6562 7974 653a 7028 302c 3229 0069 3a28 302c 3129
3353320 0065 7870 616e 6462 6974 6d61 703a 6628 302c 3129 006c 703a 7028 302c 3238 2900 736d 616c 6c3a 2832 2c33 2900 6c61 7267
3353400 653a 2832 2c33 2900 7373 697a 653a 2830 2c31 2900 6c73 697a 653a 2830 2c31 2900 6765 745f 666d 6f64 653a 6628 322c 3329
3353460 006d 6f64 653a 7028 322c 3329 0070 6879 736f 7065 6e3a 6628 302c 3239 2900 706e 616d 653a 7028 302c 3337 293d 2a28 322c
3353540 3329 006d 6f64 653a 7028 322c 3329 006e 6164 653a 2832 2c33 2900 6670 3a28 302c 3239 2900 636f 6465 6368 6172 3a28 302c
3353620 3229 0062 7569 6c64 6c69 623a 6628 302c 3238 2900 6670 3a70 2830 2c32 3929 006e 616d 653a 7028 322c 3329 0063 6f64 6563
3353700 6861 723a 7028 302c 3229 006c 703a 2830 2c32 3829 006d 656d 6770 3a28 342c 3929 006c 6f61 6473 6571 3a66 2832 2c33 2900
3353760 6c70 3a70 2830 2c32 3829 0072 6563 6e75 6d3a 7028 302c 3129 0073 697a 653a 7028 302c 3129 0064 756d 703a 7028 302c 3338
3354040 293d 2a28 302c 3129 0072 6563 733a 2830 2c31 2900 626c 6f63 6b73 697a 653a 2830 2c31 2900 6f6c 6465 6e64 3a28 302c 3129
3354120 006e 6578 7472 6563 6e75 6d3a 2830 2c31 2900 626c 6f63 6b3a 2832 2c33 2900 6375 7270 6f73 3a28 322c 3329 006c 6f70 656e
3354200 3a46 2838 2c35 2900 6e61 6d65 3a70 2832 2c33 2900 6d6f 6465 3a70 2832 2c33 2900 6c70 3a28 302c 3239 2900 693a 2830 2c31
3354260 2900 6469 7269 7863 6f75 6e74 3a28 302c 3129 0062 6d69 7863 6f75 6e74 3a28 302c 3129 0064 6972 6978 6573 3a28 302c 3338
3354340 2900 626d 6978 6573 3a28 302c 3338 2900 6e65 776c 6962 3a28 302c 3429 0077 7269 7469 6e67 3a28 302c 3429 0064 6972 7370
3354420 6163 653a 2832 2c33 2900 6c69 626e 616d 553a 2832 2c33 2900 6c66 703a 2830 2c32 3929 0072 6561 6464 6972 6563 746f 7279
3354500 3a66 2830 2c31 2900 6c70 3a70 2830 2c32 3829 0073 7061 6365 3a70 2832 2c33 2900 7369 7a65 3a70 2830 2c31 2900 6469 723a
3354560 2837 2c31 2900 656e 743a 2830 2c32 3629 0064 703a 2830 2c32 3529 006c 6973 743a 2830 2c32 3529 006c 656e 3a28 302c 3129
3354640 006c 636c 6f73 653a 4628 302c 3129 0075 7365 726c 703a 7028 382c 3529 006c 703a 2830 2c32 3929 0070 6c70 3a28 302c 3339
3354720 293d 2a28 302c 3238 2900 6470 3a28 302c 3235 2900 6d6c 636f 6470 6163 743a 6628 302c 3129 006c 703a 7028 302c 3238 2900
3355000 7074 723a 2830 2c34 3029 3d2a 2830 2c32 3529 0077 7269 7465 6469 7265 6374 6f72 793a 6628 302c 3129 006c 703a 7028 302c
3355060 3238 2900 6470 3a28 302c 3235 2900 656e 743a 2830 2c32 3629 0066 703a 2830 2c32 3929 006d 656d 7369 7a65 3a28 302c 3129
3355140 0074 6f74 616c 7369 7a65 3a28 302c 3129 006e 756d 7265 6373 3a28 302c 3129 0072 6563 6e75 6d3a 2830 2c31 2900 726f 6f6d
3355220 6c65 6674 3a28 302c 3129 0063 6865 636b 7369 7a65 3a28 302c 3129 006e 6578 7472 6563 6e75 6d3a 2830 2c31 2900 6461 7461
3355300 3a28 322c 3329 0077 7269 7465 6269 746d 6170 3a66 2830 2c31 2900 6c70 3a70 2830 2c32 3829 006e 756d 7265 6373 3a28 302c
3355360 3129 0069 3a28 302c 3129 0072 6563 6e75 6d3a 2830 2c31 2900 6e65 7874 7265 636e 756d 3a28 302c 3129 0069 6e64 6963 6573
3355440 3a28 302c 3338 2900 6461 7461 3a28 322c 3329 0066 703a 2830 2c32 3929 006c 6962 736f 7065 6e3a 4628 302c 3431 293d 2a28
```

| | | | | | | | | | | | | | | | | | | | | | | | | |
|---|---|---|---|---|---|---|---|---|---|---|---|---|---|---|---|---|---|---|---|---|---|---|---|---|
| 3355520 | 382c | 3529 | 006e | 616d | 6573 | 3a70 | 2830 | 2c33 | 3729 | 006c | 6962 | 7479 | 7065 | 3a70 | 2832 | 2c33 | 2900 | 7277 | 3a70 | 2832 | 2c33 | 2900 | 693a | 2830 |
| 3355600 | 2c31 | 2900 | 633a | 2830 | 2c31 | 2900 | 6c69 | 6e65 | 6e75 | 6d3a | 2830 | 2c31 | 2900 | 6670 | 3a28 | 302c | 3239 | 2900 | 666e | 616d | 653a | 2830 | 2c34 | 3229 |
| 3355660 | 3d61 | 7228 | 302c | 3129 | 3b30 | 3b39 | 393b | 2830 | 2c32 | 2900 | 6669 | 7273 | 743a | 2830 | 2c34 | 3229 | 0070 | 7472 | 3a28 | 322c | 3329 | 0066 | 6f70 | 6d6f |
| 3355740 | 6465 | 3a28 | 322c | 3329 | 006c | 703a | 2838 | 2c35 | 2900 | 6469 | 7273 | 6565 | 6b3a | 6628 | 302c | 3235 | 2900 | 736f | 7567 | 6374 | 3a70 | 2832 | 2c33 | 2900 |
| 3356020 | 6c70 | 3a70 | 2830 | 2c32 | 3829 | 0072 | 6573 | 3a28 | 302c | 3235 | 2900 | 6765 | 746d | 656d | 623a | 6628 | 302c | 3237 | 2900 | 6c70 | 3a70 | 2830 | 2c32 | 3829 |
| 3356100 | 006d | 656d | 623a | 2830 | 2c32 | 3729 | 0063 | 7265 | 6174 | 6564 | 6972 | 656e | 743a | 6628 | 302c | 3236 | 2900 | 6c70 | 3a70 | 2830 | 2c32 | 3829 | 006d | 656d |
| 3356160 | 626e | 6161 | 653a | 7028 | 322c | 3329 | 0065 | 6e74 | 3a28 | 302c | 3236 | 2900 | 7369 | 7a65 | 3a28 | 302c | 3129 | 006d | 6f70 | 656e | 3a46 | 2830 | 2c34 | 3329 |
| 3356240 | 3d2a | 2838 | 2c32 | 2900 | 7573 | 6572 | 6c70 | 3a70 | 2838 | 2c35 | 2900 | 6d65 | 6d62 | 6e61 | 6d65 | 3a70 | 2832 | 2c33 | 2900 | 6d6f | 6465 | 7374 | 723a | 7028 |
| 3356320 | 322c | 3329 | 006c | 703a | 2830 | 2c32 | 3829 | 006d | 656d | 623a | 2830 | 2c32 | 3729 | 006d | 6f64 | 653a | 2830 | 2c32 | 2900 | 6465 | 6d3a | 2830 | 2c32 | 3529 |
| 3356400 | 006d | 6469 | 723a | 2830 | 2c32 | 3629 | 0072 | 6563 | 6675 | 6c6c | 3a28 | 302c | 3129 | 0064 | 726f | 705f | 6d65 | 6d62 | 6572 | 3a66 | 2830 | 2c31 | 2900 | 6c70 |
| 3356460 | 3a70 | 2830 | 2c32 | 3829 | 0065 | 6e74 | 3a70 | 2830 | 2c32 | 3629 | 0072 | 6563 | 6978 | 3a28 | 302c | 3129 | 0069 | 3a28 | 302c | 3129 | 0070 | 3a28 | 322c | 3329 |
| 3356540 | 006d | 666c | 7573 | 683a | 6628 | 302c | 3129 | 006d | 703a | 7028 | 302c | 3237 | 2900 | 6d63 | 6c6f | 7365 | 3a46 | 2830 | 2c31 | 2900 | 7573 | 6572 | 6d70 | 3a70 |
| 3356620 | 2830 | 2c34 | 3329 | 006d | 703a | 2830 | 2c32 | 3729 | 006d | 6465 | 6c65 | 7465 | 3a46 | 2830 | 2c31 | 2900 | 7573 | 6572 | 6c70 | 3a70 | 2838 | 2c35 | 2900 | 6d65 |
| 3356700 | 6d62 | 6e61 | 6d65 | 3a70 | 2832 | 2c33 | 2900 | 6c70 | 3a28 | 302c | 3238 | 2900 | 6d65 | 6d3a | 2830 | 2c32 | 3529 | 006d | 6765 | 7463 | 5f65 | 6f72 | 3a66 | 2830 |
| 3356760 | 2c31 | 2900 | 6d70 | 3a70 | 2830 | 2c32 | 3729 | 006d | 6469 | 7270 | 3a28 | 302c | 3236 | 2900 | 6d67 | 6574 | 633a | 4628 | 302c | 3129 | 0075 | 7365 | 726d | 703a |
| 3357040 | 7028 | 302c | 3433 | 2900 | 6d70 | 3a72 | 2830 | 2c32 | 3729 | 006d | 756e | 6765 | 7463 | 3a46 | 2830 | 2c31 | 2900 | 6368 | 3a70 | 2830 | 2c31 | 2900 | 7573 | 6572 |
| 3357120 | 6d70 | 3a70 | 2830 | 2c34 | 3329 | 006d | 703a | 2830 | 2c32 | 3729 | 006d | 7075 | 7463 | 5f65 | 6f72 | 3a66 | 2830 | 2c31 | 2900 | 6368 | 3a70 | 2830 | 2c32 | 2900 |
| 3357200 | 6d70 | 3a70 | 2830 | 2c32 | 3729 | 006c | 703a | 2830 | 2c32 | 3829 | 006e | 6578 | 7472 | 6563 | 3a28 | 302c | 3129 | 0064 | 656e | 743a | 2830 | 2c32 | 3629 | 006d |
| 3357260 | 7075 | 7463 | 3a46 | 2830 | 2c31 | 2900 | 6368 | 3a70 | 2830 | 2c31 | 2900 | 7573 | 6572 | 6d70 | 3a70 | 2830 | 2c34 | 3329 | 006d | 703a | 7228 | 302c | 3237 | 2900 |
| 3357340 | 6d72 | 6561 | 643a | 4628 | 302c | 3129 | 0064 | 706e | 743a | 7028 | 322c | 3329 | 0073 | 697a | 653a | 7028 | 302c | 3129 | 006e | 656c | 656d | 3a70 | 2830 | 2c31 |
| 3357420 | 2900 | 6d70 | 3a70 | 2830 | 2c34 | 3329 | 0064 | 706e | 743a | 7228 | 322c | 3329 | 006b | 3a72 | 2830 | 2c31 | 2900 | 6370 | 3a72 | 2832 | 2c33 | 2900 | 693a | 2830 |
| 3357500 | 2c31 | 2900 | 6a3a | 2830 | 2c31 | 2900 | 696e | 7463 | 683a | 2830 | 2c31 | 2900 | 636f | 756e | 743a | 2830 | 2c31 | 2900 | 6d6d | 703a | 2830 | 2c32 | 3729 | 006d |
| 3357560 | 6772 | 6162 | 3a46 | 2830 | 2c31 | 2900 | 7465 | 7874 | 3a70 | 2832 | 2c33 | 2900 | 6272 | 6561 | 6b73 | 6574 | 3a70 | 2832 | 2c33 | 2900 | 6d61 | 7863 | 6861 | 7273 |
| 3357640 | 3a70 | 2830 | 2c31 | 2900 | 7573 | 6572 | 6d70 | 3a70 | 2830 | 2c34 | 3329 | 0070 | 7472 | 3a72 | 2832 | 2c33 | 2900 | 6370 | 3a72 | 2832 | 2c33 | 2900 | 626c | 6f63 |
| 3357720 | 6b3a | 7228 | 302c | 3129 | 0064 | 6174 | 756d | 3a72 | 2830 | 2c31 | 2900 | 6d70 | 3a28 | 302c | 3237 | 2900 | 6578 | 636c | 7564 | 653a | 2830 | 2c31 | 2900 | 7374 |
| 3360000 | 6f70 | 6f6e | 3a56 | 2830 | 2c34 | 3429 | 3d61 | 7228 | 302c | 3129 | 3b30 | 3b32 | 3535 | 3b28 | 302c | 3229 | 006c | 6578 | 5f6d | 656d | 6265 | 723a | 4628 | 302c |
| 3360060 | 3129 | 0062 | 7566 | 663a | 7028 | 322c | 3329 | 0075 | 7365 | 726d | 7070 | 3a70 | 2830 | 2c33 | 3729 | 0063 | 703a | 7228 | 322c | 3329 | 0064 | 706e | 743a | 7228 |
| 3360140 | 322c | 3329 | 0062 | 6c6f | 636b | 3a72 | 2830 | 2c31 | 2900 | 6d70 | 3a72 | 2830 | 2c32 | 3729 | 0063 | 6861 | 7273 | 6c65 | 6674 | 3a28 | 302c | 3129 | 006d | 7772 |
| 3360220 | 6974 | 653a | 4628 | 302c | 3129 | 0062 | 7566 | 3a70 | 2832 | 2c33 | 2900 | 7369 | 7a65 | 3a70 | 2830 | 2c31 | 2900 | 6e65 | 6c65 | 6d3a | 7028 | 302c | 3129 | 0075 |
| 3360300 | 7365 | 726d | 703a | 7028 | 302c | 3433 | 2900 | 693a | 7228 | 302c | 3129 | 006a | 3a72 | 2830 | 2c31 | 2900 | 6d70 | 7269 | 6e74 | 663a | 4628 | 302c | 3129 | 0075 |
| 3360360 | 7365 | 726d | 703a | 7028 | 302c | 3433 | 2900 | 666f | 726d | 6174 | 3a70 | 2832 | 2c33 | 2900 | 7031 | 3a70 | 2834 | 2c32 | 2900 | 7032 | 3a70 | 2834 | 2c32 | 2900 |
| 3360440 | 7033 | 3a70 | 2834 | 2c32 | 2900 | 7034 | 3a70 | 2834 | 2c32 | 2900 | 7035 | 3a70 | 2834 | 2c32 | 2900 | 7036 | 3a70 | 2834 | 2c32 | 2900 | 6275 | 6666 | 3a28 | 302c |
| 3360520 | 3435 | 2931 | 6172 | 2830 | 2c31 | 293b | 303b | 3235 | 363b | 2830 | 2c32 | 2900 | 7074 | 723a | 2832 | 2c33 | 2900 | 6c69 | 626c | 6573 | 7366 | 3a46 | 2830 | 2c31 |
| 3360600 | 2900 | 613a | 7028 | 332c | 3235 | 2900 | 623a | 7028 | 302c | 3235 | 2900 | 6c6e | 616d | 653a | 4628 | 302c | 3436 | 293d | 2a28 | 382c | 3329 | 0075 | 7365 | 726c |
| 3360660 | 703a | 7028 | 382c | 3529 | 0072 | 6573 | 7461 | 7274 | 3a70 | 2830 | 2c31 | 2900 | 6c6e | 6161 | 6570 | 6970 | 653a | 5628 | 382c | 3329 | 006c | 703a | 2830 | 2c32 |
| 3360740 | 3829 | 006d | 6469 | 7270 | 3a28 | 302c | 3236 | 2900 | 6470 | 3a28 | 302c | 3235 | 2900 | 6c73 | 697a | 653a | 4628 | 302c | 3129 | 0075 | 7365 | 726c | 703a | 7028 |
| 3361020 | 382c | 3529 | 006d | 656d | 626e | 616d | 653a | 7028 | 322c | 3329 | 006c | 703a | 2830 | 2c32 | 3829 | 006d | 6469 | 7270 | 3a28 | 302c | 3236 | 2900 | 6470 | 3a28 |
| 3361100 | 302c | 3235 | 2900 | 6469 | 6e66 | 6f3a | 4628 | 302c | 3437 | 293d | 2a28 | 382c | 3429 | 006d | 703a | 7028 | 302c | 3237 | 2900 | 6772 | 6f75 | 703a | 7028 | 342c |
| 3361160 | 3929 | 0072 | 6573 | 756c | 743a | 2830 | 2c34 | 3729 | 006c | 6962 | 6669 | 6c65 | 3a46 | 2830 | 2c32 | 3929 | 006c | 703a | 7028 | 382c | 3529 | 006d | 656d | 6264 |
| 3361240 | 6174 | 653a | 4628 | 322c | 3329 | 0062 | 7566 | 3a70 | 2832 | 2c33 | 2900 | 6e61 | 6d65 | 3a70 | 2832 | 2c33 | 2900 | 6c70 | 3a70 | 2838 | 2c35 | 2900 | 6470 | 3a28 |
| 3361320 | 302c | 3235 | 2900 | 7365 | 746d | 656d | 6264 | 6174 | 653a | 4628 | 302c | 3129 | 0062 | 7566 | 3a70 | 2832 | 2c33 | 2900 | 7573 | 6572 | 6d70 | 3a70 | 2830 | 2c34 |
| 3361400 | 3329 | 006d | 703a | 2830 | 2c32 | 3729 | 0070 | 7472 | 3a28 | 322c | 3329 | 006c | 6962 | 5f66 | 7265 | 655f | 6279 | 7465 | 733a | 4628 | 302c | 3129 | 0075 | 7365 |
| 3361460 | 726c | 703a | 7028 | 382c | 3529 | 006c | 703a | 2830 | 2c32 | 3829 | 0074 | 6f74 | 7369 | 7a65 | 3a28 | 302c | 3129 | 0064 | 703a | 2830 | 2c32 | 3529 | 006d | 656d |
| 3361540 | 6264 | 756d | 703a | 4628 | 302c | 3129 | 0073 | 3a70 | 2832 | 2c33 | 2900 | 6d65 | 6d62 | 6572 | 726f | 723a | 6628 | 302c | 3129 | 0075 | 7365 | 726d | 703a | 7028 |
| 3361620 | 302c | 3433 | 2900 | 6675 | 6e63 | 3a70 | 2832 | 2c33 | 2900 | 6163 | 7469 | 6f6e | 3a70 | 2832 | 2c33 | 2900 | 6d70 | 3a28 | 302c | 3237 | 2900 | 6d65 | 6d67 | 6174 |
| 3361700 | 653a | 2830 | 2c34 | 3829 | 3d61 | 7228 | 302c | 3129 | 3b30 | 3b33 | 393b | 2830 | 2c32 | 2900 | 6570 | 7269 | 6e74 | 663a | 6628 | 302c | 3129 | 0073 | 3a70 | 2832 |
| 3361760 | 2c33 | 2900 | 7031 | 3a70 | 2830 | 2c31 | 2900 | 7032 | 3a70 | 2830 | 2c31 | 2900 | 7033 | 3a70 | 2830 | 2c31 | 2900 | 7034 | 3a70 | 2830 | 2c31 | 2900 | 6865 | 6164 |
| 3362040 | 3a28 | 322c | 3329 | 0074 | 6169 | 6c3a | 2832 | 2c33 | 2900 | 6c69 | 6261 | 626f | 7274 | 3a66 | 2830 | 2c31 | 2900 | 733a | 7028 | 322c | 3329 | 0070 | 313a | 7028 |
| 3362120 | 302c | 3129 | 0070 | 323a | 7028 | 302c | 3129 | 0070 | 333a | 7028 | 302c | 3129 | 0070 | 343a | 7028 | 302c | 3129 | 0066 | 696e | 663a | 2830 | 2c34 | 3929 | 3d2a |
| 3362200 | 2832 | 2c32 | 2900 | 7365 | 7269 | 6f75 | 733a | 2830 | 2c32 | 2900 | 666c | 6962 | 7472 | 6163 | 653a | 6628 | 302c | 3129 | 0073 | 3a70 | 2832 | 2c33 | 2900 | 7031 |
| 3362260 | 3a70 | 2830 | 2c31 | 2900 | 7032 | 3a70 | 2830 | 2c31 | 2900 | 7033 | 3a70 | 2830 | 2c31 | 2900 | 7034 | 3a70 | 2830 | 2c31 | 2900 | 6765 | 7473 | 6e65 | 616b | 3a66 |
| 3362340 | 2832 | 2c33 | 2900 | 6670 | 3a70 | 2830 | 2c32 | 3929 | 0074 | 6578 | 743a | 2830 | 2c34 | 3229 | 0073 | 3a28 | 322c | 3329 | 0069 | 3a28 | 302c | 3129 | 0063 | 683a |
| 3362420 | 2830 | 2c31 | 2900 | 696e | 6974 | 5f6c | 6962 | 733a | 6628 | 302c | 3129 | 0066 | 703a | 2830 | 2c32 | 3929 | 0073 | 3a28 | 322c | 3329 | 0074 | 6578 | 743a | 2830 |
| 3362500 | 2c33 | 3329 | 006c | 7369 | 6c65 | 782e | 6f00 | 5f63 | 6c61 | 7373 | 6966 | 7900 | 5f74 | 7572 | 6e6f | 6666 | 005f | 6765 | 746d | 6f72 | 6569 | 6e70 | 7574 | 005f |
| 3362560 | 6c73 | 696c | 6578 | 6964 | 005f | 736b | 6970 | 636f | 6d6d | 656e | 7400 | 5f62 | 6163 | 6b73 | 6c61 | 7368 | 005f | 6e65 | 7874 | 6c69 | 6e65 | 005f | 7075 | 7368 |

| | | | | | | | | | | | | | | | | | | | | | | | | |
|---|---|---|---|---|---|---|---|---|---|---|---|---|---|---|---|---|---|---|---|---|---|---|---|---|
| 3362640 | 6261 | 636b | 005f | 6461 | 5f69 | 6400 | 5f69 | 6e70 | 7574 | 6368 | 6172 | 005f | 6c6f | 6f6b | 6168 | 6561 | 6400 | 5f6c | 7369 | 6e68 | 7368 | 6964 | 005f | 6c73 |
| 3362720 | 6967 | 7061 | 6c69 | 6400 | 5f62 | 7261 | 6e63 | 685f | 7461 | 6200 | 5f69 | 6e69 | 746f | 7065 | 7261 | 746f | 7273 | 005f | 7263 | 7369 | 6400 | 5f73 | 7472 | 696e |
| 3363000 | 676c | 6974 | 005f | 6261 | 6463 | 616c | 6c00 | 2f68 | 6f61 | 652f | 6f73 | 6173 | 322f | 622f | 6465 | 762f | 4c49 | 4253 | 2f72 | 656c | 3130 | 2f4c | 5349 | 2f73 |
| 3363060 | 756e | 342f | 006c | 7369 | 6c65 | 782e | 6300 | 696e | 743a | 7428 | 302c | 3129 | 3d72 | 2830 | 2c31 | 293b | 2d32 | 3134 | 3734 | 3833 | 3634 | 383b | 3231 | 3437 |
| 3363140 | 3438 | 3336 | 3437 | 3b00 | 6368 | 6172 | 3a74 | 2830 | 2c32 | 293d | 7228 | 302c | 3229 | 3b30 | 3b31 | 3237 | 3b00 | 6c6f | 6e67 | 3a74 | 2830 | 2c33 | 293d | 7228 |
| 3363220 | 302c | 3129 | 3b2d | 3231 | 3437 | 3438 | 3336 | 3438 | 3b32 | 3134 | 3734 | 3833 | 3634 | 373b | 0073 | 686f | 7274 | 3a74 | 2830 | 2c34 | 293d | 7228 | 302c | 3129 |
| 3363300 | 3b2d | 3332 | 3736 | 383b | 3332 | 3736 | 373b | 0075 | 6e73 | 6967 | 6e65 | 6420 | 6368 | 6172 | 3a74 | 2830 | 2c35 | 293d | 7228 | 302c | 3129 | 3b30 | 3b32 | 3535 |
| 3363360 | 3b00 | 756e | 7369 | 676e | 6564 | 2073 | 686f | 7274 | 3a74 | 2830 | 2c36 | 293d | 7228 | 302c | 3129 | 3b30 | 3b36 | 3535 | 3335 | 3b00 | 756e | 7369 | 676e | 6564 |
| 3363440 | 206c | 6f6e | 673a | 7428 | 302c | 3729 | 3d72 | 2830 | 2c31 | 293b | 303b | 2d31 | 3b00 | 756e | 7369 | 676e | 6564 | 2069 | 6e74 | 3a74 | 2830 | 2c38 | 293d | 7228 |
| 3363520 | 302c | 3129 | 3b30 | 3b2d | 313b | 0066 | 6c6f | 6174 | 3a74 | 2830 | 2c39 | 293d | 7228 | 302c | 3129 | 3b34 | 3b30 | 3b00 | 646f | 7562 | 6c65 | 3a74 | 2830 | 2c31 |
| 3363600 | 3029 | 3d72 | 2830 | 2c31 | 293b | 383b | 303b | 0076 | 6f69 | 643a | 7428 | 302c | 3131 | 293d | 2830 | 2c31 | 3129 | 003f | 3f3f | 3a74 | 2830 | 2c31 | 3229 | 3d28 |
| 3363660 | 302c | 3129 | 3072 | 6373 | 6964 | 3a53 | 2830 | 2c31 | 3329 | 3d61 | 7228 | 302c | 3129 | 3b30 | 3b36 | 353b | 2830 | 2c32 | 2900 | 2f75 | 7372 | 2f69 | 6e63 | 6c75 |
| 3363740 | 6465 | 2f73 | 7464 | 696f | 2e68 | 002e | 2f6c | 7369 | 6770 | 616c | 2e68 | 002e | 2f6c | 7369 | 6770 | 616c | 2e68 | 006c | 7369 | 6770 | 616c | 6964 | 3a53 | 2832 |
| 3364020 | 2c31 | 293d | 6172 | 2830 | 2c31 | 293b | 303b | 3632 | 3b28 | 302c | 3229 | 002f | 7573 | 722f | 6c73 | 692f | 6465 | 762f | 746f | 6f6c | 6c69 | 622f | 696e | 636c |
| 3364100 | 7564 | 652f | 6d61 | 2e68 | 002f | 7573 | 722f | 6c73 | 692f | 6465 | 762f | 746f | 6f6c | 6c69 | 622f | 696e | 636c | 7564 | 652f | 6d61 | 2e68 | 006d | 615f | 6964 |
| 3364160 | 3a53 | 2833 | 2c31 | 293d | 6172 | 2830 | 2c31 | 293b | 303b | 3539 | 3b28 | 302c | 3229 | 0070 | 6f69 | 6e74 | 6572 | 3a74 | 2833 | 2c32 | 293d | 2a28 | 332c | 3329 |
| 3364240 | 3d61 | 7228 | 302c | 3129 | 3b30 | 3b30 | 3b28 | 332c | 3429 | 3d61 | 7228 | 302c | 3129 | 3b30 | 3b30 | 3b28 | 332c | 3529 | 3d61 | 7228 | 302c | 3129 | 3b30 | 3b30 |
| 3364320 | 3b28 | 332c | 3629 | 3d61 | 7228 | 302c | 3129 | 3b30 | 3b30 | 3b28 | 332c | 3729 | 3d61 | 7228 | 302c | 3129 | 3b30 | 3b30 | 3b28 | 332c | 3829 | 3d61 | 7228 | 302c |
| 3364400 | 3129 | 3b30 | 3b30 | 3b28 | 302c | 3229 | 0062 | 6f6f | 6c65 | 616e | 3a74 | 2833 | 2c31 | 2900 | 6d61 | 5f67 | 726f | 7570 | 3a74 | 2833 | 2c39 | 293d | 2a28 | 332c |
| 3364460 | 3130 | 293d | 7334 | 6d61 | 5f67 | 726f | 7570 | 3a28 | 302c | 3129 | 2c30 | 2c33 | 323b | 3b00 | 6675 | 6e63 | 7469 | 6f6e | 3a74 | 2833 | 2c31 | 3129 | 3d2a | 2833 |
| 3364540 | 2c31 | 3229 | 3d66 | 2830 | 2c31 | 2900 | 6165 | 6d5f | 616c | 6c6f | 6361 | 7465 | 643a | 4728 | 302c | 3129 | 006d | 656d | 5f75 | 7365 | 643a | 4728 | 302c | 3129 |
| 3364620 | 006f | 7574 | 5f6f | 665f | 6d65 | 6d6f | 7279 | 5f66 | 756e | 6374 | 696f | 6e3a | 4728 | 332c | 3131 | 2900 | 2e2f | 6c73 | 696e | 6873 | 682e | 6800 | 2e2f | 6c73 |
| 3364700 | 696e | 6873 | 682e | 6900 | 6c73 | 696e | 6873 | 6869 | 643a | 5328 | 332c | 3129 | 002e | 2f6c | 7369 | 6770 | 616c | 2e68 | 002f | 7573 | 722f | 6c73 | 692f | 6465 |
| 3364760 | 762f | 746f | 6f6c | 6c69 | 622f | 696e | 636c | 7564 | 652f | 6874 | 2e68 | 0068 | 6173 | 685f | 7461 | 626c | 653a | 7428 | 362c | 3129 | 002e | 2f6c | 7369 | 6c65 |
| 3365040 | 782e | 6800 | 2e2f | 6c73 | 696c | 6578 | 2e68 | 006c | 7369 | 6c65 | 7869 | 643a | 5328 | 302c | 3133 | 2900 | 7473 | 7472 | 6561 | 643a | 7428 | 372c | 3129 | 3d2a |
| 3365120 | 2830 | 2c32 | 2900 | 6c65 | 7872 | 6561 | 736f | 6e3a | 4728 | 302c | 3129 | 0073 | 7472 | 696e | 673a | 7428 | 372c | 3129 | 0069 | 6e5f | 7374 | 7272 | 6563 | 3a74 |
| 3365200 | 2830 | 2c31 | 3429 | 3173 | 3131 | 3132 | 746f | 6b65 | 6e3a | 2830 | 2c31 | 3529 | 3d61 | 7228 | 302c | 3129 | 3b30 | 3b32 | 3539 | 3b28 | 302c | 3229 | 2c30 | 2c32 |
| 3365260 | 3038 | 303b | 6c69 | 6e65 | 6e75 | 6d3a | 2830 | 2c31 | 3629 | 3d2a | 2830 | 2c31 | 292c | 3230 | 3830 | 2c33 | 323b | 6e65 | 7874 | 6368 | 3a28 | 372c | 3129 | 2c32 |
| 3365340 | 3131 | 322c | 3332 | 3b64 | 6174 | 616c | 6566 | 743a | 2830 | 2c31 | 292c | 3231 | 3434 | 2c33 | 323b | 6d61 | 7873 | 796d | 626f | 6c3a | 2830 | 2c31 | 292c | 3231 |
| 3365420 | 3736 | 2c33 | 323b | 7472 | 6164 | 656d | 6172 | 6b3a | 2830 | 2c31 | 292c | 3232 | 3038 | 2c33 | 323b | 616d | 6f75 | 6e74 | 7265 | 6164 | 3a28 | 302c | 3129 | 2c32 |
| 3365500 | 3234 | 302c | 3332 | 3b6c | 696e | 6566 | 726f | 6e74 | 3a28 | 302c | 3129 | 2c32 | 3237 | 322c | 3332 | 3b5c | 0075 | 6e72 | 6563 | 3a28 | 302c | 3429 | 2c32 | 3330 |
| 3365560 | 342c | 3136 | 3b65 | 6f66 | 6b65 | 793a | 2830 | 2c34 | 292c | 3233 | 3230 | 2c31 | 363b | 6964 | 6b65 | 793a | 2830 | 2c34 | 292c | 3233 | 3336 | 2c31 | 363b | 696e |
| 3365640 | 746b | 6579 | 3a28 | 302c | 3429 | 2c32 | 3335 | 322c | 3136 | 3b6e | 756d | 6b65 | 793a | 2830 | 2c34 | 292c | 3233 | 3638 | 2c31 | 363b | 656f | 663a | 2830 | 2c32 |
| 3365720 | 292c | 3233 | 3834 | 2c38 | 3b62 | 6163 | 6b73 | 6c6f | 6e3a | 2830 | 2c32 | 292c | 3233 | 3932 | 2c38 | 3b72 | 6573 | 6e61 | 6d65 | 733a | 2830 | 2c32 | 292c | 3234 |
| 3366000 | 3030 | 2c38 | 3b5c | 0069 | 6e73 | 656e | 7369 | 7469 | 7665 | 3a28 | 302c | 3229 | 2c32 | 3430 | 382c | 383b | 636f | 6d6e | 6573 | 7469 | 6e67 | 3a28 | 302c | 3229 |
| 3366060 | 2c32 | 3431 | 362c | 383b | 6772 | 6f75 | 703a | 2833 | 2c39 | 292c | 3234 | 3332 | 2c33 | 323b | 776f | 7264 | 733a | 2836 | 2c31 | 292c | 3234 | 3634 | 2c33 | 323b |
| 3366140 | 6f70 | 6572 | 6174 | 6f72 | 733a | 2830 | 2c31 | 3729 | 3d2a | 2830 | 2c34 | 292c | 3234 | 3936 | 2c33 | 323b | 6669 | 6c6c | 6675 | 6e63 | 3a28 | 332c | 3131 | 292c |
| 3366220 | 3235 | 3238 | 2c33 | 323b | 6d6f | 7265 | 776f | 726b | 3a28 | 332c | 3131 | 292c | 3235 | 3630 | 2c33 | 323b | 6572 | 7266 | 756e | 633a | 2833 | 2c31 | 3129 | 2c32 |
| 3366300 | 3539 | 322c | 3332 | 3b5c | 0073 | 6f75 | 7263 | 653a | 2837 | 2c31 | 292c | 3236 | 3234 | 2c33 | 323b | 6c62 | 7566 | 6673 | 3a28 | 372c | 3129 | 2c32 | 3635 | 362c |
| 3366360 | 3332 | 3b65 | 6f66 | 636c | 3a28 | 302c | 3138 | 293d | 6172 | 2830 | 2c31 | 293b | 303b | 333b | 2830 | 2c32 | 292c | 3236 | 3838 | 2c33 | 323b | 636c | 6173 | 733a |
| 3366440 | 2830 | 2c31 | 3929 | 3d61 | 7228 | 302c | 3129 | 3b30 | 3b32 | 3535 | 3b28 | 302c | 3229 | 2c32 | 3732 | 302c | 3230 | 3438 | 3b62 | 7566 | 663a | 2830 | 2c32 | 3029 |
| 3366520 | 3d61 | 7228 | 302c | 3129 | 3b30 | 3b35 | 3135 | 3b28 | 302c | 3229 | 2c34 | 3736 | 382c | 3431 | 3238 | 3b3b | 0069 | 6e5f | 7374 | 723a | 7428 | 302c | 3231 | 293d |
| 3366600 | 2a28 | 302c | 3134 | 2900 | 6272 | 616e | 6368 | 5f74 | 6162 | 3a53 | 2830 | 2c32 | 3229 | 3d61 | 7228 | 302c | 3129 | 3b30 | 3b32 | 3b28 | 302c | 3129 | 0063 | 6c61 |
| 3366660 | 7373 | 6966 | 793a | 6628 | 302c | 3129 | 0061 | 7272 | 6179 | 3a70 | 2837 | 2c31 | 2900 | 636c | 6173 | 733a | 7028 | 302c | 3129 | 0073 | 6574 | 3a70 | 2837 | 2c31 |
| 3366740 | 2900 | 6c73 | 696c | 6578 | 2e63 | 0074 | 7572 | 6e5f | 6666 | 3a66 | 2830 | 2c31 | 2900 | 7473 | 7472 | 3a70 | 2830 | 2c32 | 3129 | 0073 | 3a70 | 2837 | 2c31 | 2900 |
| 3367020 | 7461 | 626c | 653a | 2837 | 2c31 | 2900 | 6368 | 3a28 | 302c | 3229 | 0062 | 6164 | 6361 | 6c6c | 3a66 | 2830 | 2c31 | 2900 | 6675 | 6e63 | 3a70 | 2837 | 2c31 | 2900 |
| 3367100 | 696e | 6974 | 6f70 | 6572 | 6174 | 6f72 | 733a | 6628 | 302c | 3129 | 0074 | 7374 | 723a | 7028 | 302c | 3231 | 2900 | 693a | 2830 | 2c31 | 2900 | 7074 | 723a | 2830 |
| 3367160 | 2c31 | 3729 | 006c | 6578 | 6372 | 6561 | 7465 | 3a46 | 2837 | 2c31 | 2900 | 6d65 | 6d67 | 703a | 7028 | 332c | 3929 | 006f | 6666 | 6368 | 6172 | 733a | 7028 | 372c |
| 3367240 | 3129 | 0075 | 6e72 | 6563 | 3a70 | 2830 | 2c31 | 2900 | 656f | 666b | 6579 | 3a70 | 2830 | 2c31 | 2900 | 6964 | 6b65 | 793a | 7028 | 302c | 3129 | 0069 | 6e74 | 6b65 |
| 3367320 | 793a | 7028 | 302c | 3129 | 006e | 756d | 6b65 | 793a | 7028 | 302c | 3129 | 0074 | 7374 | 723a | 2830 | 2c32 | 3129 | 0069 | 3a28 | 302c | 3129 | 0070 | 7472 | 3a28 |
| 3367400 | 372c | 3129 | 006c | 6578 | 6c65 | 7474 | 6572 | 3a46 | 2830 | 2c31 | 2900 | 6574 | 7374 | 723a | 7028 | 372c | 3129 | 0066 | 6c61 | 673a | 7028 | 302c | 3129 | 0073 |
| 3367460 | 3a70 | 2837 | 2c31 | 2900 | 7473 | 7472 | 3a28 | 302c | 3231 | 2900 | 7461 | 626c | 653a | 2837 | 2c31 | 2900 | 636c | 7074 | 723a | 2837 | 2c31 | 2900 | 6c65 | 7869 |
| 3367540 | 6e73 | 656e | 7369 | 7469 | 7665 | 3a46 | 2830 | 2c31 | 2900 | 6574 | 7374 | 723a | 7028 | 372c | 3129 | 0074 | 7374 | 723a | 2830 | 2c32 | 3129 | 006c | 6578 | 6e6f |
| 3367620 | 6e65 | 7374 | 3a46 | 2830 | 2c31 | 2900 | 6574 | 7374 | 723a | 7028 | 372c | 3129 | 0074 | 7374 | 723a | 2830 | 2c32 | 3129 | 006c | 6578 | 756e | 6172 | 793a | 4628 |
| 3367700 | 302c | 3129 | 0065 | 7473 | 7472 | 3a70 | 2837 | 2c31 | 2900 | 7473 | 7472 | 3a28 | 302c | 3231 | 2900 | 6c65 | 7877 | 6f72 | 6b66 | 756e | 633a | 4628 | 302c | 3129 |

| | | | | | | | | | | | | | | | | | | | | | | | | |
|---|---|---|---|---|---|---|---|---|---|---|---|---|---|---|---|---|---|---|---|---|---|---|---|---|
| 3367760 | 0065 | 7473 | 7472 | 3a70 | 2837 | 2c31 | 2900 | 6666 | 756e | 633a | 7028 | 332c | 3131 | 2900 | 7473 | 7472 | 3a28 | 302c | 3231 | 2900 | 6c65 | 7865 | 7272 | 6675 |
| 3370040 | 6e63 | 3a46 | 2830 | 2c31 | 2900 | 6574 | 7374 | 723a | 7028 | 372c | 3129 | 0066 | 6675 | 6e63 | 3a70 | 2833 | 2c31 | 3129 | 0074 | 7374 | 723a | 2830 | 2c32 | 3129 |
| 3370120 | 006c | 6578 | 7175 | 6f74 | 653a | 4628 | 302c | 3129 | 0065 | 7473 | 7472 | 3a70 | 2837 | 2c31 | 2900 | 776f | 7264 | 3a70 | 2837 | 2c31 | 2900 | 6b65 | 793a | 7028 |
| 3370200 | 302c | 3129 | 0074 | 7374 | 723a | 2830 | 2c32 | 3129 | 0063 | 683a | 2830 | 2c32 | 2900 | 6c65 | 7872 | 6573 | 7764 | 3a46 | 2830 | 2c31 | 2900 | 6574 | 7374 | 723a |
| 3370260 | 7028 | 372c | 3129 | 0077 | 6f72 | 643a | 7028 | 372c | 3129 | 006b | 6579 | 3a70 | 2830 | 2c31 | 2900 | 7473 | 7472 | 3a28 | 302c | 3231 | 2900 | 636c | 7074 | 723a |
| 3370340 | 2837 | 2c31 | 2900 | 7463 | 6c61 | 7373 | 3a28 | 372c | 3129 | 0077 | 7074 | 723a | 2837 | 2c31 | 2900 | 6669 | 7273 | 7463 | 3a28 | 302c | 3129 | 0063 | 6c61 | 7373 |
| 3370420 | 3a28 | 302c | 3129 | 0077 | 6c65 | 6e67 | 7468 | 3a28 | 302c | 3129 | 006c | 6578 | 7277 | 6f72 | 6473 | 3a46 | 2830 | 2c31 | 2900 | 6574 | 7374 | 723a | 7028 | 372c |
| 3370500 | 3129 | 0074 | 6162 | 6c65 | 3a70 | 2830 | 2c32 | 3329 | 3d2a | 2837 | 2c31 | 2900 | 6b65 | 793a | 7028 | 302c | 3129 | 0074 | 7374 | 723a | 2830 | 2c32 | 3129 | 0077 |
| 3370560 | 6f72 | 643a | 2837 | 2c31 | 2900 | 6c65 | 7863 | 6f64 | 656e | 756d | 3a46 | 2830 | 2c31 | 2900 | 6574 | 7374 | 723a | 7028 | 372c | 3129 | 0077 | 6f72 | 643a | 7028 |
| 3370640 | 372c | 3129 | 0074 | 7374 | 723a | 2830 | 2c32 | 3129 | 0072 | 6573 | 3a28 | 302c | 3129 | 006c | 6578 | 6f70 | 656e | 3a46 | 2830 | 2c31 | 2900 | 6574 | 7374 | 723a |
| 3370720 | 7028 | 372c | 3129 | 0066 | 6675 | 6e63 | 3a70 | 2833 | 2c31 | 3129 | 0073 | 6f75 | 7263 | 653a | 7028 | 372c | 3129 | 0074 | 7374 | 723a | 2830 | 2c32 | 3129 | 006e |
| 3371000 | 6578 | 746c | 696e | 653a | 6628 | 302c | 3129 | 0074 | 7374 | 723a | 7028 | 302c | 3231 | 2900 | 6765 | 746d | 6f72 | 6569 | 6e70 | 7574 | 3a66 | 2830 | 2c31 | 2900 |
| 3371060 | 7473 | 7472 | 3a70 | 2830 | 2c32 | 3129 | 0069 | 6e70 | 7574 | 6368 | 6172 | 3a66 | 2830 | 2c31 | 2900 | 7473 | 7472 | 3a70 | 2830 | 2c32 | 3129 | 0070 | 7573 | 6862 |
| 3371140 | 6163 | 6b3a | 6628 | 302c | 3129 | 0074 | 7374 | 723a | 7028 | 302c | 3231 | 2900 | 6368 | 3a70 | 2830 | 2c31 | 2900 | 6c6f | 6f6b | 6168 | 6561 | 643a | 6628 | 302c |
| 3371220 | 3129 | 0074 | 7374 | 723a | 7028 | 302c | 3231 | 2900 | 6469 | 7374 | 3a70 | 2830 | 2c31 | 2900 | 6e65 | 7764 | 6174 | 613a | 2830 | 2c31 | 2900 | 693a | 2830 | 2c31 |
| 3371300 | 2900 | 7074 | 723a | 2837 | 2c31 | 2900 | 6f70 | 7472 | 3a28 | 372c | 3129 | 0073 | 6b69 | 7063 | 6f6d | 6d65 | 6e74 | 3a66 | 2830 | 2c31 | 2900 | 7473 | 7472 | 3a70 |
| 3371360 | 2830 | 2c32 | 3129 | 0063 | 3a28 | 302c | 3129 | 0073 | 7461 | 7274 | 3a28 | 302c | 3129 | 006c | 6576 | 656c | 3a28 | 302c | 3129 | 006c | 6173 | 7463 | 3a28 | 302c |
| 3371440 | 3129 | 0062 | 6163 | 6b73 | 6c61 | 7368 | 3a66 | 2830 | 2c31 | 2900 | 7473 | 7472 | 3a70 | 2830 | 2c32 | 3129 | 0063 | 3a28 | 302c | 3129 | 0072 | 6573 | 3a28 | 302c |
| 3371520 | 3129 | 0064 | 6967 | 6974 | 733a | 2830 | 2c31 | 2900 | 7374 | 7269 | 6e67 | 6c69 | 743a | 6628 | 302c | 3129 | 0074 | 7374 | 723a | 7028 | 302c | 3231 | 2900 | 7175 |
| 3371600 | 6f74 | 655f | 6368 | 3a70 | 2830 | 2c32 | 2900 | 633a | 2830 | 2c31 | 2900 | 6c65 | 6e3a | 2830 | 2c31 | 2900 | 7074 | 723a | 2837 | 2c31 | 2900 | 6c65 | 786c | 6368 |
| 3371660 | 6172 | 3a46 | 2830 | 2c31 | 2900 | 6574 | 7374 | 723a | 7028 | 372c | 3129 | 0074 | 7374 | 723a | 2830 | 2c32 | 3129 | 006c | 6578 | 6368 | 6172 | 3a46 | 2830 | 2c31 |
| 3371740 | 2900 | 6574 | 7374 | 723a | 7028 | 372c | 3129 | 0074 | 7374 | 723a | 2830 | 2c32 | 3129 | 006c | 6578 | 6c69 | 6e65 | 7661 | 723a | 4628 | 302c | 3129 | 0065 | 7473 |
| 3372020 | 7472 | 3a70 | 2837 | 2c31 | 2900 | 7076 | 6172 | 3a70 | 2830 | 2c31 | 3629 | 0074 | 7374 | 723a | 2830 | 2c32 | 3129 | 006c | 6578 | 6772 | 6162 | 3a46 | 2830 | 2c31 |
| 3372100 | 2900 | 6275 | 6666 | 3a70 | 2837 | 2c31 | 2900 | 6272 | 6561 | 6b73 | 6574 | 3a70 | 2837 | 2c31 | 2900 | 6d61 | 7863 | 6f75 | 6e74 | 3a70 | 2830 | 2c31 | 2900 | 6574 |
| 3372160 | 7374 | 723a | 7028 | 372c | 3129 | 0063 | 3a28 | 302c | 3129 | 0070 | 7472 | 3a28 | 372c | 3129 | 0063 | 6c61 | 7373 | 3a28 | 372c | 3129 | 0065 | 7863 | 6c75 | 6465 |
| 3372240 | 3a28 | 302c | 3129 | 0074 | 7374 | 723a | 2830 | 2c32 | 3129 | 006c | 6578 | 6c6f | 6164 | 3a46 | 2837 | 2c31 | 2900 | 6574 | 7374 | 723a | 7028 | 372c | 3129 | 0062 |
| 3372320 | 7265 | 616b | 7365 | 743a | 7028 | 372c | 3129 | 006d | 656d | 6770 | 3a70 | 2833 | 2c39 | 2900 | 7370 | 7472 | 3a28 | 372c | 3129 | 0072 | 7074 | 723a | 2837 | 2c31 |
| 3372400 | 2900 | 6275 | 6666 | 3a28 | 372c | 3129 | 0072 | 6573 | 3a28 | 372c | 3129 | 006c | 696e | 6b3a | 2830 | 2c32 | 3329 | 0073 | 697a | 653a | 2830 | 2c31 | 2900 | 626c |
| 3372460 | 6f63 | 6b3a | 2830 | 2c31 | 2900 | 7473 | 7472 | 3a28 | 302c | 3231 | 2900 | 6c65 | 7867 | 6574 | 3a46 | 2830 | 2c31 | 2900 | 6574 | 7374 | 723a | 7028 | 372c | 3129 |
| 3372540 | 0063 | 3a28 | 302c | 3129 | 0063 | 6c61 | 7373 | 3a28 | 302c | 3129 | 0069 | 3a28 | 302c | 3129 | 006e | 633a | 2830 | 2c31 | 2900 | 746f | 636c | 613a | 2830 | 2c31 |
| 3372620 | 2900 | 746f | 6b3a | 2837 | 2c31 | 2900 | 7265 | 733a | 2837 | 2c31 | 2900 | 7463 | 6c61 | 7373 | 3a28 | 372c | 3129 | 0074 | 7374 | 723a | 2830 | 2c32 | 3129 | 006c |
| 3372700 | 6578 | 5f66 | 696c | 653a | 4628 | 302c | 3129 | 0062 | 7566 | 663a | 7028 | 372c | 3129 | 0066 | 7070 | 3a70 | 2830 | 2c32 | 3329 | 0066 | 703a | 2830 | 2c32 | 3429 |
| 3372760 | 3d2a | 2831 | 2c31 | 2900 | 633a | 2830 | 2c31 | 2900 | 693a | 2830 | 2c31 | 2900 | 6c65 | 785f | 7465 | 726d | 696e | 616c | 3a46 | 2830 | 2c31 | 2900 | 6275 | 6666 |
| 3373040 | 3a70 | 2837 | 2c31 | 2900 | 6475 | 6d6d | 793a | 7028 | 302c | 3233 | 2900 | 633a | 2830 | 2c31 | 2900 | 693a | 2830 | 2c31 | 2900 | 6c65 | 785f | 7374 | 7269 | 6e67 |
| 3373120 | 3a46 | 2830 | 2c31 | 2900 | 6275 | 6666 | 3a70 | 2837 | 2c31 | 2900 | 7073 | 7472 | 3a70 | 2830 | 2c32 | 3329 | 0073 | 3a28 | 372c | 3129 | 0069 | 3a28 | 302c | 3129 |
| 3373200 | 006c | 7369 | 666f | 702e | 6f00 | 5f61 | 6464 | 5f6e | 616d | 6500 | 5f61 | 6464 | 5f62 | 6163 | 6b00 | 5f62 | 6164 | 666e | 616d | 6500 | 5f62 | 6164 | 5f63 | 6f6e |
| 3373260 | 7600 | 5f74 | 7261 | 6365 | 5f6f | 7065 | 6e00 | 5f63 | 6f6e | 765f | 7461 | 6200 | 5f63 | 7574 | 5f74 | 7970 | 6500 | 5f63 | 6f6e | 765f | 7374 | 7200 | 5f63 | 7572 |
| 3373340 | 5f63 | 6f6e | 7600 | 5f65 | 7272 | 5f65 | 7869 | 7400 | 5f66 | 6f70 | 5f6e | 616d | 6500 | 5f67 | 6574 | 5f77 | 6f72 | 6400 | 5f69 | 6e69 | 745f | 666f | 7000 | 5f74 |
| 3373420 | 6163 | 6b5f | 6f6e | 005f | 636f | 6e76 | 7300 | 5f70 | 6174 | 6800 | 5f6c | 7369 | 7379 | 7369 | 6400 | 5f6c | 7462 | 5f74 | 6578 | 7400 | 5f6c | 6f61 | 645f | 656e |
| 3373500 | 7600 | 5f6c | 6173 | 7463 | 6f6e | 7600 | 5f63 | 6f6e | 765f | 6669 | 6c65 | 005f | 636f | 7079 | 5f63 | 6f6e | 7600 | 5f6e | 616d | 655f | 7365 | 7400 | 5f65 | 7874 |
| 3373560 | 656e | 7369 | 6f6e | 005f | 7061 | 7468 | 5f6c | 656e | 005f | 6164 | 645f | 656e | 765f | 706c | 6163 | 6500 | 5f66 | 696e | 645f | 6669 | 6c65 | 005f | 6675 | 6c6c |
| 3373640 | 5f6e | 616d | 6500 | 5f66 | 696e | 645f | 7061 | 7468 | 005f | 6669 | 6e64 | 5f63 | 6f6e | 7600 | 5f61 | 6374 | 6976 | 6500 | 5f77 | 6f72 | 6400 | 5f73 | 6176 | 655f |
| 3373720 | 7374 | 7200 | 5f6d | 615f | 6964 | 005f | 6d65 | 6d67 | 7000 | 5f6c | 7369 | 6e68 | 7368 | 6964 | 005f | 6c73 | 6967 | 7061 | 6c69 | 6400 | 5f6c | 6173 | 745f | 7469 |
| 3374000 | 6d65 | 005f | 6d61 | 6b65 | 5f63 | 6f6e | 7600 | 5f72 | 6373 | 6964 | 005f | 6f70 | 656e | 5f66 | 696c | 6500 | 5f6f | 7065 | 6e5f | 6d6f | 6465 | 005f | 6578 | 7465 |
| 3374060 | 6e64 | 5f64 | 6972 | 005f | 666f | 705f | 696e | 6974 | 6564 | 005f | 7265 | 6164 | 5f6c | 696e | 6500 | 5f6c | 6f6f | 6b75 | 7000 | 5f73 | 686f | 7274 | 6e61 | 6d65 |
| 3374140 | 005f | 6375 | 745f | 6469 | 7200 | 5f64 | 6f5f | 6c69 | 6e65 | 005f | 646f | 5f73 | 6361 | 6e00 | 5f65 | 6e76 | 5f76 | 6172 | 005f | 6164 | 645f | 746f | 5f70 | 6174 |
| 3374220 | 6800 | 5f6c | 6f61 | 645f | 6d6f | 6465 | 7300 | 5f63 | 686f | 6f73 | 655f | 6e61 | 6d65 | 005f | 7375 | 6264 | 6972 | 005f | 6275 | 6666 | 005f | 636c | 6973 | 005f |
| 3374300 | 7265 | 6164 | 5f73 | 7461 | 7465 | 002f | 686f | 6d65 | 2f6f | 7361 | 7332 | 2f62 | 2f64 | 6576 | 2f4c | 4942 | 532f | 7265 | 6c31 | 302f | 4c53 | 492f | 7375 | 6e34 |
| 3374360 | 2f00 | 6c73 | 6966 | 6f70 | 2e63 | 0069 | 6e74 | 3a74 | 2830 | 2c31 | 293d | 7228 | 302c | 3129 | 3b2d | 3231 | 3437 | 3439 | 3336 | 3438 | 3b32 | 3134 | 3734 | 3833 |
| 3374440 | 3634 | 373b | 0063 | 6961 | 723a | 7428 | 302c | 3229 | 3d72 | 2830 | 2c32 | 293b | 303b | 3132 | 373b | 006c | 6f6e | 673a | 7428 | 302c | 3329 | 3d72 | 2830 | 2c31 |
| 3374520 | 293b | 2d32 | 3134 | 3734 | 3833 | 3634 | 383b | 3231 | 3437 | 3438 | 3336 | 3437 | 3b00 | 7368 | 6f72 | 743a | 7428 | 302c | 3429 | 3d72 | 2830 | 2c31 | 293b | 2d33 |
| 3374600 | 3237 | 3638 | 3b33 | 3237 | 3637 | 3b00 | 756e | 7369 | 676e | 6564 | 2063 | 6861 | 723a | 7428 | 302c | 3529 | 3d72 | 2830 | 2c31 | 293b | 303b | 3235 | 353b | 0075 |
| 3374660 | 5e73 | 6967 | 6e65 | 6420 | 7368 | 6f72 | 743a | 7428 | 302c | 3629 | 3d72 | 2830 | 2c31 | 293b | 303b | 3635 | 3533 | 353b | 0075 | 6e73 | 6967 | 6e65 | 6420 | 6c6f |
| 3374740 | 6e67 | 3a74 | 2830 | 2c37 | 293d | 7228 | 302c | 3129 | 3b30 | 3b2d | 313b | 0075 | 6e73 | 6967 | 6e65 | 6420 | 696e | 743a | 7428 | 302c | 3829 | 3d72 | 2830 | 2c31 |
| 3375020 | 293b | 303b | 2d31 | 3b00 | 666c | 6f61 | 743a | 7428 | 302c | 3929 | 3d72 | 2830 | 2c31 | 293b | 343b | 303b | 0064 | 6f75 | 626c | 653a | 7428 | 302c | 3130 | 293d |

| | | | | | | | | | | | | | | | | | | | | | | | | |
|---|---|---|---|---|---|---|---|---|---|---|---|---|---|---|---|---|---|---|---|---|---|---|---|---|
| 3375100 | 7228 | 302c | 3129 | 3b38 | 3b30 | 3b00 | 766f | 6964 | 3a74 | 2830 | 2c31 | 3129 | 3128 | 302c | 3131 | 2900 | 3f3f | 3f3a | 7428 | 302c | 3132 | 293d | 2830 | 2c31 |
| 3375160 | 2900 | 7263 | 7369 | 643a | 5328 | 302c | 3133 | 293d | 6172 | 2830 | 2c31 | 293b | 303b | 3537 | 3b28 | 302c | 3229 | 002f | 7573 | 722f | 696e | 636c | 7564 | 652f |
| 3375240 | 7374 | 6469 | 6f2e | 6900 | 2e2f | 6c73 | 6967 | 7061 | 5c2e | 6800 | 2e2f | 6c73 | 6967 | 7061 | 6c2e | 6800 | 6c73 | 6967 | 7061 | 6c69 | 643a | 5328 | 322c | 3129 |
| 3375320 | 3d61 | 7228 | 302c | 3129 | 3b30 | 3b36 | 323b | 2830 | 2c32 | 2900 | 2f75 | 7372 | 2f6c | 7369 | 2f64 | 6576 | 2f74 | 6f6f | 6c6c | 6962 | 2f69 | 6e63 | 6c75 | 6465 |
| 3375400 | 2f6d | 612e | 6800 | 2f75 | 7372 | 2f6c | 7369 | 2f64 | 6576 | 2f74 | 6f6f | 6c6c | 6962 | 2f69 | 6e63 | 6c75 | 6465 | 2f6d | 612e | 6800 | 6d61 | 5f69 | 643a | 5328 |
| 3375460 | 332c | 3129 | 3d61 | 7228 | 302c | 3129 | 3b30 | 3b35 | 393b | 2830 | 2c32 | 2900 | 706f | 696e | 7465 | 723a | 7428 | 332c | 3229 | 3d2a | 2833 | 2c33 | 293d | 6172 |
| 3375540 | 2830 | 2c31 | 293b | 303b | 303b | 2833 | 2c34 | 293d | 6172 | 2830 | 2c31 | 293b | 303b | 303b | 2833 | 2c35 | 293d | 6172 | 2830 | 2c31 | 293b | 303b | 303b | 2833 |
| 3375620 | 2c36 | 293d | 6172 | 2830 | 2c31 | 293b | 303b | 303b | 2833 | 2c37 | 293d | 6172 | 2830 | 2c31 | 293b | 303b | 303b | 2833 | 2c38 | 293d | 6172 | 2830 | 2c31 | 293b |
| 3375700 | 303b | 303b | 2830 | 2c32 | 2900 | 626f | 6f6c | 6561 | 6e3a | 7428 | 302c | 3129 | 006d | 615f | 6772 | 6f75 | 703a | 7428 | 332c | 3929 | 3d2a | 2833 | 2c31 | 3029 |
| 3375760 | 3d73 | 346d | 615f | 6772 | 6f75 | 703a | 2830 | 2c31 | 292c | 302c | 3332 | 3b3b | 0066 | 756e | 6374 | 696f | 6e3a | 7428 | 332c | 3131 | 293d | 2a28 | 332c | 3132 |
| 3376040 | 293d | 6628 | 302c | 3129 | 006d | 656d | 5f61 | 6c6c | 6f63 | 6174 | 6564 | 3a47 | 2830 | 2c31 | 2900 | 6165 | 6d5f | 7573 | 6564 | 3a47 | 2830 | 2c31 | 2900 | 6f75 |
| 3376120 | 745f | 6f66 | 5f6d | 656d | 6f72 | 795f | 6675 | 6e63 | 7469 | 6f6e | 3a47 | 2833 | 2c31 | 3129 | 002e | 2f6c | 7369 | 6e68 | 7368 | 2e68 | 002e | 2f6c | 7369 | 6e68 |
| 3376200 | 7368 | 2e68 | 006c | 7369 | 6e68 | 7368 | 6964 | 3a53 | 2833 | 2c31 | 2900 | 2e2f | 6c73 | 6967 | 7061 | 6c2e | 6800 | 2f75 | 7372 | 2f6c | 7369 | 2f64 | 6576 | 2f74 |
| 3376260 | 6f6f | 6c6c | 6962 | 2f69 | 6e63 | 6c75 | 6465 | 2f68 | 742e | 6800 | 6861 | 7368 | 5f74 | 6162 | 6c65 | 3a74 | 2836 | 2c31 | 2900 | 2e2f | 6c73 | 6973 | 7973 | 2e68 |
| 3376340 | 002e | 2f6c | 7369 | 7379 | 732e | 6800 | 6c73 | 6973 | 7973 | 6964 | 3a53 | 2837 | 2c31 | 293d | 6172 | 2830 | 2c31 | 293b | 303b | 3631 | 3b28 | 302c | 3229 | 0066 |
| 3376420 | 696c | 6569 | 6e66 | 6f3a | 5428 | 372c | 3229 | 3d73 | 3136 | 756e | 6971 | 7565 | 5f69 | 643a | 2837 | 2c33 | 293d | 2a28 | 302c | 3229 | 2c30 | 2c33 | 323b | 666e |
| 3376500 | 616d | 653a | 2837 | 2c33 | 292c | 3332 | 2c33 | 323b | 7265 | 765f | 6461 | 7465 | 3a28 | 372c | 3329 | 2c36 | 342c | 3332 | 3b74 | 6f74 | 616c | 5f62 | 7974 | 6573 |
| 3376560 | 3a28 | 302c | 3129 | 2c39 | 362c | 3332 | 3b3b | 0046 | 494c | 4549 | 4e46 | 4f3a | 7428 | 372c | 3229 | 0073 | 7472 | 696e | 673a | 7428 | 372c | 3329 | 0063 | 6f6e |
| 3376640 | 7673 | 3a53 | 2830 | 2c31 | 3429 | 3d61 | 7228 | 302c | 3129 | 3b30 | 3b31 | 3535 | 3b28 | 372c | 3329 | 0066 | 6f70 | 6e52 | 4543 | 3a54 | 2830 | 2c31 | 3529 | 3d73 |
| 3376720 | 3136 | 6e65 | 7874 | 3a28 | 302c | 3136 | 293d | 2a28 | 302c | 3135 | 292c | 302c | 3332 | 3b66 | 703a | 2830 | 2c31 | 3729 | 3d2a | 2831 | 2c31 | 292c | 3332 | 2c33 |
| 3377000 | 323b | 666f | 705f | 6e61 | 6d65 | 3a28 | 372c | 3329 | 2c36 | 342c | 3332 | 3b73 | 686f | 7274 | 6e61 | 6d65 | 3a28 | 372c | 3329 | 2c39 | 362c | 3332 | 3b3b | 0066 |
| 3377060 | 6f70 | 6e72 | 6563 | 3a74 | 2830 | 2c31 | 3529 | 0066 | 6f70 | 6e3a | 7428 | 302c | 3136 | 2900 | 636f | 6e76 | 5245 | 433a | 5428 | 302c | 3138 | 293d | 7332 | 306e |
| 3377140 | 6578 | 743a | 2830 | 2c31 | 3929 | 3d2a | 2830 | 2c31 | 3829 | 2c30 | 2c33 | 323b | 6e61 | 6165 | 3a28 | 372c | 3329 | 2c33 | 322c | 3332 | 3b76 | 616c | 313a | 2837 |
| 3377220 | 2c33 | 292c | 3634 | 2c33 | 323b | 7661 | 6c32 | 3a28 | 372c | 3329 | 2c39 | 362c | 3332 | 3b6d | 6f64 | 6573 | 3a28 | 302c | 3139 | 292c | 3132 | 382c | 3332 | 3b3b |
| 3377300 | 0063 | 6f6e | 7672 | 6563 | 3a74 | 2830 | 2c31 | 3829 | 0063 | 6f6e | 763a | 7428 | 302c | 3139 | 2900 | 666f | 705f | 7472 | 6163 | 653a | 4728 | 302c | 3129 | 006c |
| 3377360 | 7369 | 666f | 702e | 6300 | 666f | 705f | 6669 | 6c65 | 3a47 | 2837 | 2c33 | 2900 | 666f | 705f | 6d6f | 643a | 4728 | 372c | 3329 | 0066 | 6f70 | 5f74 | 696d | 653a |
| 3377440 | 4728 | 372c | 3329 | 0066 | 6f70 | 5f76 | 6572 | 3a47 | 2837 | 2c33 | 2900 | 666f | 705f | 7072 | 653a | 4728 | 372c | 3329 | 0066 | 6f70 | 5f73 | 7566 | 3a47 | 2837 |
| 3377520 | 2c33 | 2900 | 666f | 705f | 7069 | 643a | 4728 | 372c | 3329 | 0066 | 6f70 | 5f74 | 6563 | 683a | 4728 | 372c | 3329 | 0066 | 6f70 | 5f64 | 6965 | 3a47 | 2837 | 2c33 |
| 3377600 | 2900 | 666f | 705f | 6163 | 6374 | 3a47 | 2837 | 2c33 | 2900 | 666f | 705f | 6361 | 7365 | 3a47 | 2837 | 2c33 | 2900 | 666f | 705f | 6174 | 7472 | 3a47 | 2837 | 2c33 |
| 3377660 | 2900 | 666f | 705f | 696f | 7069 | 7463 | 693a | 4728 | 372c | 3329 | 0066 | 6f70 | 5f78 | 7369 | 7a65 | 3a47 | 2837 | 2c33 | 2900 | 666f | 705f | 7973 | 697a | 653a |
| 3377740 | 4728 | 372c | 3329 | 0066 | 6f70 | 5f69 | 6e69 | 7465 | 643a | 5328 | 302c | 3129 | 0063 | 6c69 | 733a | 5328 | 302c | 3139 | 2900 | 6c61 | 7374 | 636f | 6e76 | 3a53 |
| 3400020 | 2830 | 2c31 | 3929 | 006d | 656d | 6770 | 3a53 | 2833 | 2c39 | 2900 | 636f | 6e76 | 5f74 | 6162 | 3a53 | 2836 | 2c31 | 2900 | 7061 | 7468 | 5f6c | 656e | 3a53 | 2830 |
| 3400100 | 2c31 | 2900 | 6163 | 7469 | 7665 | 3a53 | 2030 | 2c31 | 2900 | 646f | 5f73 | 6361 | 6e3a | 5328 | 302c | 3129 | 006f | 7065 | 6e5f | 6d6f | 6465 | 3a53 | 2837 | 2c33 |
| 3400160 | 2900 | 6375 | 725f | 636f | 6e76 | 3a53 | 2837 | 2c33 | 2900 | 7061 | 7468 | 3a53 | 2830 | 2c32 | 3029 | 3d61 | 7228 | 302c | 3129 | 3b30 | 3b39 | 393b | 2837 | 2c33 |
| 3400240 | 2900 | 6e61 | 6d65 | 5f73 | 6574 | 3a53 | 2830 | 2c31 | 3629 | 0066 | 6f70 | 5f6e | 616d | 653a | 5328 | 302c | 3231 | 293d | 6172 | 2830 | 2c31 | 293b | 303b | 3235 |
| 3400320 | 353b | 2830 | 2c32 | 2900 | 6675 | 6c6c | 5f6e | 616d | 653a | 5328 | 302c | 3231 | 2900 | 7368 | 6f72 | 746e | 616d | 653a | 5328 | 302c | 3231 | 2900 | 6275 | 6666 |
| 3400400 | 3a53 | 2830 | 2c32 | 3129 | 0077 | 6f72 | 643a | 5328 | 302c | 3231 | 2900 | 7375 | 6264 | 6972 | 3a53 | 2830 | 2c32 | 3129 | 0065 | 7874 | 656e | 7369 | 6f6e | 3a53 |
| 3400460 | 2830 | 2c32 | 3129 | 006c | 7462 | 5f74 | 6578 | 743a | 5328 | 302c | 3232 | 293d | 6172 | 2830 | 2c31 | 293b | 303b | 393b | 2830 | 2c32 | 2900 | 6572 | 725f | 6578 |
| 3400540 | 6974 | 3a66 | 2830 | 2c31 | 2900 | 733a | 7028 | 372c | 3329 | 0070 | 313a | 7028 | 372c | 3329 | 0070 | 323a | 7028 | 372c | 3329 | 0073 | 6176 | 655f | 7374 | 723a |
| 3400620 | 6628 | 372c | 3329 | 0073 | 3a70 | 2837 | 2c33 | 2900 | 723a | 2837 | 2c33 | 2900 | 6f70 | 656e | 5f66 | 696c | 653a | 6628 | 302c | 3137 | 2900 | 6670 | 3a28 | 302c |
| 3400700 | 3137 | 2900 | 7265 | 6164 | 5f6c | 696e | 653a | 6628 | 302c | 3129 | 0066 | 703a | 7028 | 302c | 3137 | 2900 | 6368 | 3a28 | 302c | 3129 | 0070 | 7472 | 3a28 | 372c |
| 3400760 | 3329 | 0067 | 6574 | 5f77 | 6f72 | 643a | 6628 | 372c | 3329 | 0070 | 7472 | 3a70 | 2837 | 2c33 | 2900 | 703a | 2837 | 2c33 | 2900 | 7461 | 636b | 5f6f | 6e3a | 6628 |
| 3401040 | 372c | 3329 | 0070 | 7472 | 3a70 | 2837 | 2c33 | 2900 | 733a | 7028 | 372c | 3329 | 006c | 6173 | 745f | 7469 | 6d65 | 3a66 | 2837 | 2c33 | 2900 | 6e3a | 2830 | 2c31 |
| 3401120 | 2900 | 6375 | 745f | 7479 | 7065 | 3a66 | 2837 | 2c33 | 2900 | 733a | 7028 | 372c | 3329 | 0070 | 7472 | 3a28 | 372c | 3329 | 0063 | 7574 | 5f64 | 6972 | 3a66 | 2837 |
| 3401200 | 2c33 | 2900 | 733a | 7028 | 372c | 3329 | 0070 | 7472 | 3a28 | 372c | 3329 | 0062 | 6164 | 666e | 616d | 653a | 6628 | 302c | 3129 | 0065 | 6e3a | 7028 | 372c | 3329 |
| 3401260 | 0066 | 743a | 7028 | 372c | 3329 | 0070 | 7269 | 6e74 | 6564 | 3a56 | 2830 | 2c31 | 2900 | 6368 | 6f6f | 7365 | 5f6e | 616d | 653a | 6628 | 302c | 3129 | 0066 | 6e61 |
| 3401340 | 6d65 | 3a70 | 2837 | 2c33 | 2900 | 6674 | 7970 | 653a | 7028 | 372c | 3329 | 0077 | 7269 | 7469 | 6e67 | 3a70 | 2830 | 2c31 | 2900 | 636e | 3a28 | 302c | 3139 | 2900 |
| 3401420 | 7265 | 733a | 2837 | 2c33 | 2900 | 7061 | 743a | 2837 | 2c33 | 2900 | 7074 | 723a | 2837 | 2c33 | 2900 | 646f | 746c | 6f63 | 3a28 | 372c | 3329 | 0063 | 683a | 2830 |
| 3401500 | 2c32 | 2900 | 7661 | 723a | 2837 | 2c33 | 2900 | 7068 | 6173 | 653a | 2830 | 2c31 | 2900 | 6e61 | 6d65 | 3a28 | 302c | 3231 | 2900 | 6361 | 7365 | 5f6c | 6574 | 7465 |
| 3401560 | 723a | 2830 | 2c32 | 3329 | 3d61 | 7228 | 302c | 3129 | 3b30 | 3b31 | 3b28 | 302c | 3229 | 0061 | 6464 | 5f6e | 616d | 653a | 6628 | 302c | 3129 | 0066 | 703a | 7028 |
| 3401640 | 302c | 3137 | 2900 | 7074 | 723a | 2830 | 2c31 | 3629 | 0066 | 696e | 645f | 6669 | 6c65 | 3a66 | 2830 | 2c31 | 3729 | 0077 | 7269 | 7469 | 6e67 | 3a70 | 2830 | 2c31 |
| 3401720 | 2900 | 693a | 2830 | 2c31 | 2900 | 6d61 | 783a | 2830 | 2c31 | 2900 | 6670 | 7472 | 3a28 | 372c | 3329 | 0066 | 703a | 2830 | 2c31 | 3729 | 0074 | 7261 | 6365 | 5f6f |
| 3402000 | 7065 | 6e3a | 6628 | 302c | 3129 | 0066 | 756e | 633a | 7028 | 372c | 3329 | 0066 | 6e61 | 6d65 | 3a70 | 2837 | 2c33 | 2900 | 6674 | 7970 | 653a | 7028 | 372c | 3329 |
| 3402060 | 0066 | 703a | 7028 | 302c | 3137 | 2900 | 666f | 7073 | 7461 | 7465 | 3a46 | 2830 | 2c31 | 2900 | 666f | 7077 | 7269 | 7465 | 3a46 | 2830 | 2c31 | 3729 | 0066 | 6e61 |
| 3402140 | 6d65 | 3a70 | 2837 | 2c33 | 2900 | 6674 | 7970 | 653a | 7028 | 372c | 3329 | 0066 | 703a | 2830 | 2c31 | 3729 | 0066 | 6f70 | 7265 | 6164 | 3a46 | 2830 | 2c31 | 3729 |

```
3402220  0066 6e61 6d65 3a70 2837 2c33 2900 6674 7970 653a 7028 372c 3329 0066 703a 2830 2c31 3729 0066 6f70 7368 6f72 746e 616d
3402300  653a 4628 372c 3329 0066 703a 7028 302c 3137 2900 7074 723a 2830 2c31 3629 0066 6f70 6e61 6d65 3a46 2837 2c33 2900 6670
3402360  3a70 2830 2c31 3729 0070 7472 3a28 302c 3136 2900 696e 6974 5f66 6f70 3a66 2830 2c31 2900 7265 6164 5f73 7461 7465 3a66
3402440  2830 2c31 2900 6669 6e64 5f70 6174 683a 6628 302c 3129 0061 6464 5f62 6163 6b3a 6628 302c 3129 0073 3a70 2837 2c33 2900
3402520  7074 723a 2837 2c33 2900 6578 7465 6e64 5f64 6972 3a66 2830 2c31 2900 6469 723a 7028 372c 3329 0065 7874 3a70 2837 2c33
3402600  2900 7074 723a 2837 2c33 2900 6164 645f 656e 765f 706c 6163 653a 6628 302c 3129 0065 6e5f 7661 723a 7028 372c 3329 0073
3402660  3a28 372c 3329 0064 6972 3a28 302c 3231 2900 6164 645f 746f 5f70 6174 683a 6628 302c 3129 0064 6972 6e61 6d65 3a70 2837
3402740  2c33 2900 6670 3a28 302c 3137 2900 616c 736f 3a28 372c 3329 0064 6972 3a28 302c 3231 2900 6261 645f 636f 6e76 3a66 2830
3403020  2c31 2900 636f 6e76 5f73 7472 3a66 2837 2c33 2900 733a 7028 372c 3329 0066 696e 645f 636f 6e76 3a66 2830 2c31 2900 693a
3403100  2830 2c31 2900 636f 6e76 5f66 696c 653a 6628 302c 3129 0073 3a70 2837 2c33 2900 6670 3a28 302c 3137 2900 676f 5f6f 6e3a
3403160  2830 2c31 2900 6c6f 6f6b 7570 3a66 2830 2c31 3929 0073 3a70 2837 2c33 2900 703a 2830 2c31 3929 0064 6f5f 6c69 6e65 3a66
3403240  2830 2c31 2900 733a 7028 372c 3329 006c 6f61 645f 6d6f 6465 733a 6628 302c 3129 0073 3a70 2837 2c33 2900 636e 3a28 302c
3403320  3139 2900 626c 6f62 3a28 302c 3231 2900 636f 7079 5f63 6f6e 763a 6628 302c 3129 0073 3a70 2837 2c33 2900 636e 3a28 302c
3403400  3139 2900 6d61 6b65 5f63 6f6e 763a 6628 302c 3129 0073 3a70 2837 2c33 2900 636e 3a28 302c 3139 2900 6368 3a28 302c 3229
3403460  0065 6e76 5f76 6172 3a66 2837 2c33 2900 733a 7028 372c 3329 0065 6e76 5f6e 616d 653a 7028 372c 3329 0070 7661 723a 7028
3403540  302c 3234 293d 2a28 372c 3329 006c 6f61 645f 656e 763a 6628 302c 3129 0066 703a 2830 2c31 3729 0063 3a28 302c 3129 0073
3403620  3a28 372c 3329 0066 6c61 6773 3a28 372c 3329 006c 7369 6770 616c 2e6f 005f 6568 5f69 6400 5f6d 615f 6964 005f 6c73 6967
3403700  7061 6c69 6400 5f72 6373 6964 005f 696e 6974 7465 6400 2f68 6f6d 652f 6f73 6173 322f 622f 6465 762f 4c49 4253 2f72 656c
3403760  3130 2f4c 5349 2f73 756e 342f 006c 7369 6770 616c 2e63 0063 6e74 3a74 2830 2c31 293d 7228 302c 3129 3b2d 3231 3437 3438
3404040  3336 3438 3b32 3134 3734 3833 3634 373b 0063 6861 723a 7428 302c 3229 3d72 2830 2c32 293b 303b 3132 373b 006c 6f6e 673a
3404120  7428 302c 3329 3472 2830 2c31 293b 2d32 3134 3734 3833 3634 383b 3231 3437 3438 3336 3437 3b00 7368 6f72 743a 7428 302c
3404200  3429 3d72 2830 2c31 293b 2d33 3237 3638 3b33 3237 3637 3b00 756e 7369 676e 6564 2063 6861 723a 7428 302c 3529 3d72 2830
3404260  2c31 293b 303b 3235 353b 0075 6e73 6967 6e65 6420 7368 6f72 743a 7428 302c 3629 3d72 2830 2c31 293b 303b 3635 3533 353b
3404340  0075 6e73 6967 6e65 6420 6c6f 6e67 3a74 2830 2c37 293d 7228 302c 3129 3b30 3b2d 313b 0075 6e73 6967 6e65 6420 696e 743a
3404420  7428 302c 3829 3472 2830 2c31 293b 303b 2d31 3b00 666c 6f61 743a 7428 302c 3929 3d72 2830 2c31 293b 343b 303b 0064 6f75
3404500  626c 653a 7428 302c 3130 293d 7228 302c 3129 3b38 3b30 3b00 766f 6964 3a74 2830 2c31 3129 3d28 302c 3131 2900 3f3f 3f3a
3404560  7428 302c 3132 293d 2830 2c31 2900 7263 7369 643a 5328 302c 3133 293d 6172 2830 2c31 293b 303b 3633 3b28 302c 3229 002f
3404640  7573 722f 696e 636c 7564 652f 7661 7261 7267 732e 6800 2f75 7372 2f6c 7369 2f64 6576 2f74 6f6f 6c6c 6962 2f69 6e63 6c75
3404720  6465 2f65 682e 6800 2f75 7372 2f6c 7369 2f64 6576 2f74 6f6f 6c6c 6962 2f69 6e63 6c75 6465 2f65 682e 6800 6568 5f69 643a
3405000  5328 322c 3129 3461 7228 302c 3129 3b30 3b36 323b 2830 2c32 2900 6568 5f65 7863 6570 7469 6f6e 3a74 2830 2c31 2900 626f
3405060  6f6c 6561 6e3a 7428 302c 3129 002e 2f6c 7369 6770 616c 2e68 002e 2f6c 7369 6770 616c 2e68 006c 7369 6770 616c 6964 3a53
3405140  2832 2c31 2900 2f75 7372 2f6c 7369 2f64 6576 2f74 6f6f 6c6c 6962 2f69 6e63 6c75 6465 2f6d 612e 6800 2f75 7372 2f6c 7369
3405220  2f64 6576 2f74 6f6f 6c6c 6962 2f69 6e63 6c75 6465 2f6d 612e 6800 6d61 5f69 643a 5328 342c 3129 3d61 7228 302c 3129 3b30
3405300  3b35 393b 2830 2c32 2900 706f 696e 7465 723a 7428 342c 3229 3d2a 2834 2c33 293d 6172 2830 2c31 293b 303b 303b 2834 2c34
3405360  293d 6172 2830 2c31 293b 303b 303b 2834 2c35 293d 6172 2830 2c31 293b 303b 303b 2834 2c36 293d 6172 2830 2c31 293b 303b
3405440  303b 2834 2c37 293d 6172 2830 2c31 293b 303b 303b 2834 2c38 293d 6172 2830 2c31 293b 303b 303b 2830 2c32 2900 6d61 5f67
3405520  726f 7570 3a74 2834 2c39 293d 2a28 342c 3130 293d 7334 6d61 5f67 726f 7570 3a28 302c 3129 2c30 2c33 323b 3b00 6675 6e63
3405600  7469 6f6e 3a74 2834 2c31 3129 3d2a 2834 2c31 3229 3466 2830 2c31 2900 6d65 6d5f 616c 6c6f 6361 7465 643a 4728 302c 3129
3405660  006d 6564 5f75 7365 643a 4728 302c 3129 006f 7574 5f6f 665f 6d65 6d6f 7279 5f66 756e 6374 696f 6e3a 4728 342c 3131 2900
3405740  6d61 5f6d 656d 5f61 6c6c 6f63 6174 6564 3a47 2830 2c31 2900 696e 6974 7465 643a 5328 302c 3129 006c 7369 6770 616c 2e63
3406020  006d 615f 6770 616c 5f68 616e 646c 6572 3a46 2830 2c31 2900 6579 6365 7074 696f 6e3a 7028 302c 3129 0070 7661 723a 7028
3406100  312c 3129 006d 615f 7265 7472 795f 616c 6c6f 633a 4728 302c 3129 0067 7061 6c6c 6f63 3a46 2834 2c39 2900 7369 7a65 3a70
3406160  2830 2c31 2900 6770 6672 6565 3a46 2830 2c31 2900 6772 6f75 703a 7028 342c 3929 007a 7161 6c6c 6f63 3a46 2834 2c32 2900
3406240  7369 7a65 3a70 2830 2c31 2900 6772 6f75 703a 7028 342c 3929 0072 6574 3a28 342c 3229 0071 616c 6c6f 633a 4628 342c 3229
3406320  0073 697a 653a 7028 302c 3129 0067 726f 7570 3a70 2834 2c39 2900 7265 743a 2834 2c32 2900 7769 6c64 5f77 7269 7465 5f63
3406400  6865 636b 3a46 2830 2c31 2900 6c73 6973 6f72 742e 6f00 5f61 6c74 6d73 6f72 7400 5f6c 696e 6b00 5f6c 6573 7366 756e 6300
3406460  5f67 726f 7570 005f 7265 7369 6e64 6578 005f 6861 7368 636f 756e 7400 5f6d 615f 6964 005f 6c73 696e 6873 6869 6400 5f6c
3406540  7369 6770 616c 6964 005f 6d65 7267 6573 6f72 7400 5f72 6373 6964 005f 636f 7079 7374 7200 5f6b 6579 005f 7265 7375 6c74
3406620  002f 686f 6d65 2f6f 7361 7332 2f62 2f64 6576 2f4c 4942 532f 7265 6c31 302f 4c53 492f 7375 6e34 2f00 6c73 6973 6f72 742e
3406700  6300 696e 743a 7428 302c 3129 3472 2830 2c31 293b 2d32 3134 3734 3833 3634 383b 3231 3437 3438 3336 3437 3b00 6368 6172
3406760  3a74 2830 2c32 293d 7228 302c 3229 3b30 3b31 3237 3b00 6c6f 6e67 3a74 2830 2c33 293d 7228 302c 3129 3b2d 3231 3437 3438
3407040  3336 3438 3b32 3134 3734 3833 3634 373b 0073 686f 7274 3a74 2830 2c34 293d 7228 302c 3129 3b2d 3332 3736 383b 3332 3736
3407120  373b 0075 6e73 6967 6e65 6420 6368 6172 3a74 2830 2c35 293d 7228 302c 3129 3b30 3b32 3535 3b00 756e 7369 676e 6564 2073
3407200  686f 7274 3a74 2830 2c36 293d 7228 302c 3129 3b30 3b36 3535 3335 3b00 756e 7369 676e 6564 206c 6f6e 673a 7428 302c 3729
3407260  3d72 2830 2c31 293b 303b 2d31 3b00 756e 7369 676e 6564 2069 6e74 3a74 2830 2c38 293d 7228 302c 3129 3b30 3b2d 313b 0066
```

```
3407340  6c6f 6174 3a74 2830 2c39 293d 7228 302c 3129 3b34 3b30 3b00 646f 7562 6c65 3a74 2830 2c31 3029 3472 2830 2c31 293b 383b
3407420  303b 0076 6f69 643a 7428 302c 3131 293d 2830 2c31 3129 003f 3f3f 3a74 2830 2c31 3229 3d28 302c 3129 0072 6373 6964 3a53
3407500  2830 2c31 3329 3d61 7228 302c 3129 3b30 3b36 333b 2830 2c32 2900 2f75 7372 2f69 6e63 6c75 6465 2f73 7464 696f 2e68 002e
3407560  2f6c 7369 6770 616c 2e68 002e 2f6c 7369 6770 616c 2e68 006c 7369 6770 616c 6964 3a53 2832 2c31 293d 6172 2830 2c31 293b
3407640  303b 3632 3b28 302c 3229 002f 7573 722f 6c73 692f 6465 762f 746f 6f6c 6c69 622f 696e 636c 7564 652f 6d61 2e68 002f 7573
3407720  722f 6c73 692f 6465 762f 746f 6f6c 6c69 622f 696e 636c 7564 652f 6d61 2e68 006d 615f 6964 3a53 2833 2c31 293d 6172 2830
3410000  2c31 293b 303b 3539 3b28 302c 3229 0070 6f69 6e74 6572 3a74 2833 2c32 293d 2a28 332c 3329 3d61 7228 302c 3129 3b30 3b30
3410060  3b28 332c 3429 3d61 7228 302c 3129 3b30 3b30 3b28 332c 3529 3d61 7228 302c 3129 3b30 3b30 3b28 332c 3629 3d61 7228 302c
3410140  3129 3b30 3b30 3b28 332c 3729 3d61 7228 302c 3129 3b30 3b30 3b28 332c 3829 3d61 7228 302c 3129 3b30 3b30 3b28 302c 3229
3410220  0062 6f6f 6c65 616e 3a74 2830 2c31 2900 6d61 5f67 726f 7570 3a74 2833 2c39 293d 2a28 332c 3130 293d 7334 6d61 5f67 726f
3410300  7570 3a28 302c 3129 2c30 2c33 323b 3b00 6675 6e63 7469 6f6e 3a74 2833 2c31 3129 3d2a 2833 2c31 3229 3d66 2830 2c31 2900
3410360  6d65 6d5f 616c 6c6f 6361 7465 643a 4728 302c 3129 006d 656d 5f75 7365 643a 4728 302c 3129 006f 7574 5f6f 665f 6d65 6d6f
3410440  7279 5f66 756e 6374 696f 6e3a 4728 332c 3131 2900 2e2f 6c73 696e 6873 682e 6800 2e2f 6c73 696e 6873 682e 6800 6c73 696e
3410520  6873 6869 643a 5328 332c 3129 002e 2f6c 7369 6770 616c 2e68 002f 7573 722f 6c73 692f 6465 762f 746f 6f6c 6c69 622f 696e
3410600  636c 7564 652f 6874 2e68 0068 6173 685f 7461 626c 653a 7428 362c 3129 0073 7472 696e 673a 7428 302c 3134 293d 2a28 302c
3410660  3229 0062 6c6f 6272 6563 3a74 2830 2c31 3529 3d73 386b 6579 3a28 332c 3229 2c30 2c33 323b 6461 7461 3a28 332c 3229 2c33
3410740  322c 3332 3b3b 0062 6c6f 623a 7428 302c 3136 293d 2a28 302c 3135 2900 6861 7368 636f 756e 743a 5328 302c 3129 0072 6573
3411020  696e 6465 783a 5328 302c 3129 006c 696e 6b3a 5328 302c 3129 006b 6579 3a53 2830 2c31 2900 7265 7375 6c74 3a53 2830 2c31
3411100  3629 0063 6f70 7973 7472 3a53 2830 2c31 2900 6772 6f75 703a 5328 332c 3929 006c 6573 7366 756e 633a 5328 332c 3131 2900
3411160  6c73 6973 6f72 743a 4628 302c 3129 0062 6173 653a 7028 302c 3136 2900 636f 756e 743a 7028 302c 3129 006c 6573 7374 6861
3411240  6e3a 7028 332c 3131 2900 6c73 6973 6f72 742e 6300 626c 6f63 6b3a 2830 2c31 2900 6c67 3a28 302c 3129 0070 6f77 6572 3a28
3411320  302c 3129 0074 6f70 3a28 302c 3136 2900 6670 7472 3a28 302c 3136 2900 6270 7472 3a28 302c 3136 2900 733a 2830 2c31 3629
3411400  0062 3a28 302c 3136 2900 7465 6d70 3a28 332c 3229 0073 7472 696e 6773 6f72 743a 4628 302c 3129 0062 6173 653a 7028 302c
3411460  3136 2900 636f 756e 743a 7028 332c 3129 0062 6c6f 636b 3a28 302c 3129 006c 673a 2830 2c31 2900 706f 7765 723a 2830 2c31
3411540  2900 746f 703a 2830 2c31 3629 0066 7074 723a 2830 2c31 3629 0062 7074 723a 2830 2c31 3629 0073 3a28 302c 3136 2900 623a
3411620  2830 2c31 3629 0074 656d 703a 2833 2c32 2900 6c65 6674 3a28 302c 3134 2900 7269 6768 743a 2830 2c31 3429 0069 6e63 6861
3411700  7368 636f 756e 743a 4628 302c 3129 0070 313a 7028 332c 3229 0070 323a 7028 332c 3229 0070 333a 7028 302c 3129 0062 7569
3411760  6c64 6172 7261 793a 4628 302c 3129 0063 6f6e 7074 723a 7028 332c 3229 006e 616d 653a 7028 302c 3134 2900 6c65 6e67 7468
3412040  3a70 2830 2c31 2900 636f 7079 3a28 302c 3134 2900 693a 2830 2c31 2900 6861 7368 736f 7274 3a46 2830 2c31 3629 0074 6162
3412120  6c65 3a70 2836 2c31 2900 6770 3a70 2833 2c39 2900 636f 7079 5f73 7472 696e 6773 3a70 2830 2c31 2900 6d65 7267 6573 6f72
3412200  743a 6628 332c 3229 006c 6973 743a 7028 332c 3229 006c 656e 6774 683a 7028 302c 3129 0069 3a28 302c 3129 0068 616c 663a
3412260  2830 2c31 2900 7374 723a 2833 2c32 2900 6672 6f6e 743a 2833 2c32 2900 6261 636b 3a28 332c 3229 0068 6561 643a 2833 2c32
3412340  2900 616c 746d 736f 7274 3a66 2833 2c32 2900 6c69 7374 3a70 2833 2c32 2900 6c65 6e67 7468 3a70 2830 2c31 2900 693a 2830
3412420  2c31 2900 6861 6c66 3a28 302c 3129 0070 7472 3a28 332c 3229 0066 726f 6e74 3a28 332c 3229 0062 6163 6b3a 2833 2c32 2900
3412500  6865 6164 3a28 332c 3229 006c 6973 7473 6f72 743a 4628 332c 3229 006c 6973 743a 7028 332c 3229 006c 696e 6b70 7472 3a70
3412560  2833 2c32 2900 6b65 7970 7472 3a70 2833 2c32 2900 6c65 7373 7468 616e 3a70 2833 2c31 3129 006c 656e 6774 683a 2830 2c31
3412640  2900 7074 723a 2833 2c32 2900 4164 6465 722e 6f00 5f73 6574 5f70 6172 616d 6574 6572 5f76 616c 7565 5f74 7970 655f 5f39
3412720  7061 7261 6d65 7465 7246 5063 005f 7365 7450 726f 705f 5f37 4e4f 626a 6563 7446 5063 6600 5f73 6574 5072 6f70 5f5f 374e
3413000  4f62 6a65 6374 4650 6369 005f 6578 706c 6169 6e5f 5f31 3662 6c6f 636b 5f61 7474 7269 6275 7465 7346 5063 005f 6765 7441
3413060  7474 725f 5f37 4e4f 626a 6563 7446 6900 5f73 6574 5f46 555f 4669 6c65 4e61 6d65 5f5f 3846 696c 6555 6e69 7446 5063 005f
3413140  7075 745f 5f37 6f73 7472 6561 6d46 6300 5f73 6574 5072 6f70 5f5f 374e 4f62 6a65 6374 4650 6354 3100 5f69 6f73 7472 6561
3413220  6d5f 696e 6974 005f 7365 744e 616d 6549 6e64 6578 5f5f 3541 6464 6572 4650 6300 5f69 734c 5445 5f5f 374e 4f62 6a65 6374
3413300  4650 364f 626a 6563 7400 5f69 7347 5445 5f5f 374c 4f62 6a65 6374 4650 364f 626a 6563 7400 5f65 7870 6c61 696e 5f5f 384c
3413360  504f 626a 6563 7446 5063 005f 6765 7450 726f 705f 5f37 4e4f 626a 6563 7446 5063 6900 5f5f 5f63 745f 5f36 656e 7469 7479
3413440  4676 005f 696e 4f72 6465 725f 5f36 4f62 6a65 6374 4650 364f 626a 6563 7400 2f68 6f6d 652f 6f73 6173 312f 612f 6162 2f73
3413520  7263 2f6e 6577 6f62 6a65 6374 732f 7072 6f67 2f4d 472f 432b 2b2e 3232 3739 302f 0041 6464 6572 2e63 0041 6464 6572 2e63
3413600  7878 0069 6e74 3a74 2830 2c31 293d 7228 302c 3129 3b2d 3231 3437 3438 3336 3438 3b32 3134 3734 3833 3634 373b 0063 6861
3413660  723a 7428 302c 3229 3d72 2830 2c32 293b 303b 3132 373b 006c 6f6e 673a 7428 302c 3329 3d72 2830 2c31 293b 2d32 3134 3734
3413740  3833 3634 383b 3231 3437 3438 3336 3437 3b00 7368 6f72 743a 7428 302c 3429 3d72 2830 2c31 293b 2d33 3237 3638 3b33 3237
3414020  3637 3b00 756e 7369 676e 6564 2063 6861 723a 7428 302c 3529 3d72 2830 2c31 293b 303b 3235 353b 0075 6e73 6967 6e65 6420
3414100  7368 6f72 743a 7428 302c 3629 3172 2830 2c31 293b 303b 3635 3533 353b 0075 6e73 6967 6e65 6420 6c6f 6e67 3a74 2830 2c37
3414160  293d 7228 302c 3129 3b30 3b2d 313b 0075 6e73 6967 6e65 6420 696e 743a 7428 302c 3829 3d72 2830 2c31 293b 303b 2d31 3b00
3414240  666c 6f61 743a 7428 302c 3929 3d72 2830 2c31 293b 343b 303b 0064 6f75 626c 653a 7428 302c 3130 293d 7228 302c 3129 3b38
3414320  3b30 3b00 766f 6964 3a74 2830 2c31 3129 3d28 302c 3131 2900 3f3f 3f3a 7428 302c 3132 293d 2830 2c31 2900 5f5f 7670 7470
3414400  3a74 2830 2c31 3329 3d2a 2830 2c31 3429 3d66 2830 2c31 2900 5f5f 6d70 7472 3a54 2830 2c31 3529 3d73 3864 3a28 302c 3429
```

```
3414460 2c30 2c31 363b 693a 2830 2c34 292c 3136 2c31 363b 663a 2830 2c31 3329 2c33 322c 3332 3b3b 005f 5046 565f 3a74 2830 2c31
3414540 3629 3d2a 2830 2c31 3729 3d66 2830 2c32 2900 5f50 4649 5f3a 7428 302c 3133 2900 6572 726e 6f3a 4728 302c 3129 0073 7973
3414620 5f6e 6572 723a 4728 302c 3129 0065 6e76 6972 6f6e 3a47 2830 2c31 3929 3d2a 2830 2c32 3029 3d2a 2830 2c32 2900 656e 643a
3414700 4728 302c 3129 0065 7465 7874 3a47 2830 2c31 2900 6564 6174 613a 4728 302c 3129 006f 7074 6172 673a 4728 302c 3230 2900
3414760 6f70 7469 6e64 3a47 2830 2c31 2900 6f70 7465 7272 3a47 2830 2c31 2900 7074 7264 6966 665f 743a 7428 302c 3129 0073 697a
3415040 655f 743a 7428 302c 3829 0073 7472 6561 6d70 6f73 3a74 2830 2c31 2900 7374 7265 616d 6f66 663a 7428 302c 3129 0069 6f5f
3415120 7374 6174 653a 5428 302c 3231 293d 6567 6f6f 6462 6974 5f5f 696f 5f73 7461 7465 3a30 2c65 6f66 6269 745f 5f69 6f5f 7374
3415200 6174 653a 312c 6661 696c 6269 745f 5f69 6f5f 7374 6174 653a 322c 6261 6462 6974 5f5f 696f 5f73 7461 7465 3a33 2c68 6172
3415260 6466 6169 6c5f 5f69 6f5f 7374 6174 653a 342c 3b00 6f70 656e 5f6d 6f64 653a 5428 302c 3232 293d 6569 6e5f 5f6f 7065 6e5f
3415340 6d6f 6465 3a30 2c6f 7574 5f5f 6f70 656e 5f6d 6f64 653a 312c 6174 655f 5f6f 7065 6e5f 6d6f 6465 3a32 2c61 7070 5f5f 6f70
3415420 656e 5f6d 6f64 653a 332c 7472 756e 635f 5f6f 7065 6e5f 6d6f 6465 3a34 2c6e 6f63 7265 6174 655f 5f6f 7065 6e5f 6d6f 6465
3415500 3a35 2c6e 6f72 6570 6c61 6365 5f5f 6f70 656e 5f6d 6f64 653a 362c 3b00 7365 656b 5f64 6972 3a54 2830 2c32 3329 3d65 6265
3415560 675f 5f73 6565 6b5f 6469 723a 302c 6375 725f 5f73 6565 6b5f 6469 723a 312c 656e 645f 5f73 6565 6b5f 6469 723a 322c 3b00
3415640 5f5f 4531 3a54 2830 2c32 3429 3d65 736b 6970 7773 5f5f 5f5f 4531 3a30 2c6c 6566 745f 5f5f 5f45 313a 312c 7269 6768 745f
3415720 5f5f 5f45 313a 322c 696e 7465 726e 616c 5f5f 5f5f 4531 3a33 2c64 6563 5f5f 5f5f 4531 3a34 2c6f 6374 5f5f 5f5f 4531 3a35
3416000 2c68 6578 5f5f 5f5f 4531 3a36 2c73 686f 7762 6173 655f 5f5f 5f45 313a 372c 5c00 7368 6f77 706f 696e 745f 5f5f 5f45 313a
3416060 382c 7570 7065 7263 6173 655f 5f5f 5f45 313a 392c 7368 6f77 706f 735f 5f5f 5f45 313a 3130 2c73 6369 656e 7469 6669 635f
3416140 5f5f 5f45 313a 3131 2c66 6978 6564 5f5f 5f5f 4531 3a31 322c 756e 6974 6275 665f 5f5f 5f45 313a 3133 2c73 7464 696f 5f5f
3416220 5f5f 4531 3a31 342c 3b00 5f5f 4532 3a54 2830 2c32 3529 3d65 736b 6970 7069 6e67 5f5f 5f5f 4532 3a30 2c74 6965 645f 5f5f
3416300 5f45 323a 312c 3b00 696f 733a 5428 302c 3236 293d 7336 306e 7573 6572 5f5f 3369 6f73 3a28 302c 3129 2c30 2c33 323b 785f
3416360 7573 6572 5f5f 3369 6f73 3a28 302c 3330 293d 2a28 302c 3237 293d 7875 696f 735f 7573 6572 5f75 6e69 6f6e 3a2c 3332 2c33
3416440 323b 6270 5f5f 3369 6f73 3a28 302c 3331 293d 2a28 302c 3238 293d 7873 7374 7265 616d 6275 663a 2c36 342c 3332 3b73 7461
3416520 7465 5f5f 3369 6f73 3a28 302c 3129 2c39 362c 3332 3b69 7370 6563 6961 6c5f 5f33 696f 733a 2830 2c31 292c 3132 382c 3332
3416600 3b6f 7370 6563 6961 6c5f 5f33 696f 733a 2830 2c31 292c 3136 302c 3332 3b69 7366 785f 7370 6563 6961 6c5f 5f33 696f 733a
3416660 2830 2c31 292c 3139 322c 3332 3b6f 7366 785f 7370 6563 6961 6c5f 5f33 696f 733a 2830 2c31 292c 3232 342c 3332 3b5c 0064
3416740 656c 6275 665f 5f33 696f 733a 2830 2c31 292c 3235 362c 3332 3b78 5f74 6965 5f5f 3369 6f73 3a28 302c 3332 293d 2a28 302c
3417020 3239 293d 7873 6f73 7472 6561 6d3a 2c32 3838 2c33 323b 785f 666c 6167 735f 5f33 696f 733a 2830 2c31 292c 3332 302c 3332
3417100 3b78 5f70 7265 6369 7369 6f6e 5f5f 3369 6f73 3a28 302c 3429 2c33 3532 2c31 363b 785f 6669 6c6c 5f5f 3369 6f73 3a28 302c
3417160 3229 2c33 3638 2c38 3b78 5f77 6964 7468 5f5f 3369 6f73 3a28 302c 3429 2c33 3834 2c31 363b 6173 7369 676e 5f70 7269 7661
3417240 7465 5f5f 3369 6f73 3a28 302c 3129 2c34 3136 2c33 323b 5f5f 7670 7472 5f5f 3369 6f73 3a28 302c 3333 293d 2a28 302c 3135
3417320 292c 3434 382c 3332 3b3b 0062 6173 6566 6965 6c64 5f5f 3369 6f73 3a47 2830 2c31 2900 6164 6a75 7374 6669 656c 645f 5f33
3417400 696f 733a 4728 302c 3129 0066 6c6f 6174 6669 656c 645f 5f33 696f 733a 4728 302c 3129 006e 6578 7462 6974 5f5f 3369 6f73
3417460 3a47 2830 2c31 2900 6e65 7874 776f 7264 5f5f 3369 6f73 3a47 2830 2c31 2900 7374 6469 6f66 6c75 7368 5f5f 3369 6f73 3a47
3417540 2830 2c31 3629 0069 6f73 3a5a 6369 6f73 3b3b 5f5f 6374 5f5f 3369 6f73 4650 3973 7472 6561 6d62 7566 205f 5f63 745f 5f33
3417620 696f 7346 7620 5f5f 6374 5f5f 3369 6f73 4652 3369 6f73 205f 5f64 745f 5f33 696f 7346 7620 666c 6167 735f 5f33 696f 7346
3417700 7620 666c 6167 735f 5f33 696f 7346 6c20 7365 7466 5f5f 3369 6f73 466c 5431 2073 6574 665f 5f33 696f 7346 6c20 756e 7365
3417760 7466 5f5f 3369 6f73 466c 2077 6964 7468 5f5f 3369 6f73 4676 2077 6964 7468 5f5f 3369 6f73 4669 2074 6965 5f5f 3369 6f73
3420040 4650 376f 7374 7265 616d 205c 0074 6965 5f5f 3369 6f73 4676 2066 696c 6c5f 5f33 696f 7346 6320 6669 6c6c 5f5f 3369 6f73
3420120 4676 2070 7265 6369 7369 6f6e 5f5f 3369 6f73 4669 2070 7265 6369 7369 6f6e 5f5f 3369 6f73 4676 2072 6473 7461 7465 5f5f
3420200 3369 6f73 4676 205f 5f6f 7050 765f 5f33 696f 7346 7620 5f5f 6e74 5f5f 3369 6f73 4676 2065 6f66 5f5f 3369 6f73 4676 2066
3420260 6169 6c5f 5f33 696f 7346 7620 6261 645f 5f33 696f 7346 7620 676f 6f64 5f5f 3369 6f73 4676 2063 6c65 6172 5f5f 3369 6f73
3420340 4669 2072 6462 7566 5f5f 3369 6f73 4676 205c 0069 776f 7264 5f5f 3369 6f73 4669 2070 776f 7264 5f5f 3369 6f73 4669 2062
3420420 6974 616c 6c6f 635f 5f33 696f 7353 4676 2078 616c 6c6f 635f 5f33 696f 7353 4676 2075 7265 7369 7a65 5f5f 3369 6f73 4669
3420500 2073 796e 635f 7769 7468 5f73 7464 696f 5f5f 3369 6f73 5346 7620 7365 7473 7461 7465 5f5f 3369 6f73 4669 2069 6e69 745f
3420560 5f33 696f 7346 5039 7374 7265 616d 6275 6620 5f5f 6173 5f5f 3369 6f73 4652 3369 6f73 2073 6b69 705f 5f33 696f 7346 6920
3420640 3b62 6173 6566 6965 6c64 5f5f 3369 6f73 205c 0061 646a 7573 7466 6965 6c64 5f5f 3369 6f73 2066 6c6f 6174 6669 656c 645f
3420720 5f33 696f 7320 6e65 7874 6269 745f 5f33 696f 7320 6e65 7874 776f 7264 5f5f 3369 6f73 2073 7464 696f 666c 7573 685f 5f33
3421000 696f 7320 3b3b 0073 7472 6561 6d62 7566 3a54 2830 2c32 3829 3d73 3430 616c 6c6f 635f 5f39 7374 7265 616d 6275 663a 2830
3421060 2c34 292c 302c 3136 3b78 5f75 6e62 7566 5f5f 3973 7472 6561 6d62 7566 3a28 302c 3429 2c31 362c 3136 3b78 5f62 6173 655f
3421140 5f39 7374 7265 616d 6275 663a 2830 2c32 3029 2c33 322c 3332 3b78 5f70 6261 7365 5f5f 3973 7472 6561 6d62 7566 3a28 302c
3421220 3230 292c 3634 2c33 323b 785f 7070 7472 5f5f 3973 7472 6561 6d62 7566 3a28 302c 3230 292c 3936 2c33 323b 785f 6570 7074
3421300 725f 5f39 7374 7265 616d 6275 663a 2830 2c32 3029 2c31 3238 2c33 323b 785f 6770 7472 5f5f 3973 7472 6561 6d62 7566 3a28
3421360 302c 3230 292c 3136 302c 3332 3b78 5f65 6770 7472 5f5f 3973 7472 6561 6d62 7566 3a28 302c 3230 292c 3139 322c 3332 3b5c
3421440 0078 5f65 6261 636b 5f5f 3973 7472 6561 6d62 7566 3a28 302c 3230 292c 3232 342c 3332 3b78 5f62 6c65 6e5f 5f39 7374 7265
3421520 616d 6275 663a 2830 2c31 292c 3235 362c 3332 3b5f 5f76 7074 725f 5f39 7374 7265 616d 6275 663a 2830 2c33 3329 2c32 3838
```

3421600 2c33 323b 3b00 7374 7265 616d 6275 663a 5a63 7374 7265 616d 6275 663b 3b5f 5f63 745f 5f39 7374 7265 616d 6275 6646 5239
3421660 7374 7265 616d 6275 6620 5f5f 6374 5f5f 3973 7472 6561 6d62 7566 4676 205f 5f63 745f 5f39 7374 7265 616d 6275 6646 5063
3421740 6920 5f5f 6374 5f5f 3973 7472 6561 6d62 7566 4650 6369 5432 205f 5f61 735f 5f39 7374 7265 616d 6275 6646 5239 7374 7265
3422020 616d 6275 6620 6462 705f 5f39 7374 7265 616d 6275 6646 7620 6261 7365 5f5f 3973 7472 6561 6d62 7566 4676 2070 6261 7365
3422100 5f5f 3973 7472 6561 6d62 7566 4676 205c 0070 7074 725f 5f39 7374 7265 616d 6275 6646 7620 6570 7074 725f 5f39 7374 7265
3422160 616d 6275 6646 7620 6770 7472 5f5f 3973 7472 6561 6d62 7566 4676 2065 6770 7472 5f5f 3973 7472 6561 6d62 7566 4676 2065
3422240 6261 636b 5f5f 3973 7472 6561 6d62 7566 4676 2065 6275 665f 5f39 7374 7265 616d 6275 6646 7620 626c 656e 5f5f 3973 7472
3422320 6561 6d62 7566 4676 2073 6574 705f 5f39 7374 7265 616d 6275 6646 5063 5431 2073 6574 675f 5f39 7374 7265 616d 6275 6646
3422400 5063 4e32 3120 7062 756d 705f 5f39 7374 7265 616d 6275 6646 6920 5c00 6762 756d 705f 5f39 7374 7265 616d 6275 6646 6920
3422460 7365 7462 5f5f 3973 7472 6561 6d62 7566 4650 6354 3169 2075 6e62 7566 6665 7265 645f 5f39 7374 7265 616d 6275 6646 7620
3422540 756e 6275 6666 6572 6564 5f5f 3973 7472 6561 6d62 7566 4669 2061 6c6c 6f63 6174 655f 5f39 7374 7265 616d 6275 6646 7620
3422620 646f 616c 6c6f 6361 7465 5f5f 3973 7472 6561 6d62 7566 4676 206f 7665 7266 6c6f 775f 5f39 7374 7265 616d 6275 6646 6920
3422700 756e 6465 7266 6c6f 775f 5f39 7374 7265 616d 6275 6646 7620 5c00 7062 6163 6b66 6169 6c5f 5f39 7374 7265 616d 6275 6646
3422760 6920 7379 6e63 5f5f 3973 7472 6561 6d62 7566 4676 2073 6565 6b6f 6666 5f5f 3973 7472 6561 6d62 7566 466c 3873 6565 6b5f
3423040 6469 7269 2073 6565 6b70 6f73 5f5f 3973 7472 6561 6d62 7566 466c 6920 7873 7075 746e 5f5f 3973 7472 6561 6d62 7566 4650
3423120 4363 6920 7873 6765 746e 5f5f 3973 7472 6561 6d62 7566 4650 6369 2069 6e5f 6176 6169 6c5f 5f39 7374 7265 616d 6275 6646
3423200 7620 6f75 745f 7761 6974 696e 675f 5f39 7374 7265 616d 6275 6646 7620 5c00 7367 6574 635f 5f39 7374 7265 616d 6275 6646
3423260 7620 736e 6578 7463 5f5f 3973 7472 6561 6d62 7566 4676 2073 6275 6d70 635f 5f39 7374 7265 616d 6275 6646 7620 7374 6f73
3423340 7363 5f5f 3973 7472 6561 6d62 7566 4676 2073 7075 7462 6163 6b63 5f5f 3973 7472 6561 6d62 7566 4663 2073 7075 7463 5f5f
3423420 3973 7472 6561 6d62 7566 4669 2073 7075 746e 5f5f 3973 7472 6561 6d62 7566 4650 4363 6920 7367 6574 6e5f 5f39 7374 7265
3423500 616d 6275 6646 5063 6920 7365 7462 7566 5f5f 3973 7472 6561 6d62 7566 4650 6369 205c 0073 6574 6275 665f 5f39 7374 7265
3423560 616d 6275 6646 5055 6369 2073 6574 6275 665f 5f39 7374 7265 616d 6275 6646 5063 6954 3220 5f5f 6474 5f5f 3973 7472 6561
3423640 6d62 7566 4676 2078 5f73 6e65 7874 635f 5f39 7374 7265 616d 6275 6646 7620 3b3b 3b00 6973 7472 6561 6d3a 5428 302c 3334
3423720 293d 7337 3278 5f67 636f 756e 745f 5f37 6973 7472 6561 6d3a 2830 2c31 292c 302c 3332 3b5f 5f76 7074 725f 5f37 6973 7472
3424000 6561 6d3a 2830 2c33 3329 2c33 322c 3332 3b50 696f 733a 2830 2c33 3529 3d2a 2830 2c32 3629 2c36 342c 3332 3b4f 696f 733a
3424060 2830 2c32 3629 2c39 362c 3438 303b 3b00 6973 7472 6561 6d3a 5a63 6973 7472 6561 6d3b 696f 733b 5f5f 6374 5f5f 3769 7374
3424140 7265 616d 4650 3973 7472 6561 6d62 7566 205f 5f63 745f 5f37 6973 7472 6561 6d46 7620 5f5f 6374 5f5f 3769 7374 7265 616d
3424220 4650 3973 7472 6561 6d62 7566 6950 376f 7374 7265 616d 205f 5f63 745f 5f37 6973 7472 6561 6d46 6950 6354 3120 5f5f 6374
3424300 5f5f 3769 7374 7265 616d 4669 5431 5037 6f73 7472 6561 6d20 5f5f 6374 5f5f 3769 7374 7265 616d 4652 3769 7374 7265 616d
3424360 205f 5f64 745f 5f37 6973 7472 6561 6d46 7620 5c00 6970 6678 5f5f 3769 7374 7265 616d 4669 2069 7366 785f 5f37 6973 7472
3424440 6561 6d46 7620 7365 656b 675f 5f37 6973 7472 6561 6d46 6c20 7365 656b 675f 5f37 6973 7472 6561 6d46 6c38 7365 656b 5f64
3424520 6972 2074 656c 6c67 5f5f 3769 7374 7265 616d 4676 205f 5f72 735f 5f37 6973 7472 6561 6d46 5046 5237 6973 7472 6561 6d5f
3424600 5237 6973 7472 6561 6d20 5f5f 7273 5f5f 3769 7374 7265 616d 4650 4652 3369 6f73 5f52 3369 6f73 205f 5f72 735f 5f37 6973
3424660 7472 6561 6d46 5063 205f 5f72 735f 5f37 6973 7472 6561 6d46 5055 6320 5c00 5f5f 7273 5f5f 3769 7374 7265 616d 4652 5563
3424740 205f 5f72 735f 5f37 6973 7472 6561 6d46 5263 205f 5f72 735f 5f37 6973 7472 6561 6d46 5273 205f 5f72 735f 5f37 6973 7472
3425020 6561 6d46 5269 205f 5f72 735f 5f37 6973 7472 6561 6d46 526c 205f 5f72 735f 5f37 6973 7472 6561 6d46 5255 7320 5f5f 7273
3425100 5f5f 3769 7374 7265 616d 4652 5569 205f 5f72 735f 5f37 6973 7472 6561 6d46 5255 6c20 5f5f 7273 5f5f 3769 7374 7265 616d
3425160 4652 6620 5f5f 7273 5f5f 3769 7374 7265 616d 4652 6420 5f5f 7273 5f5f 3769 7374 7265 616d 4650 3973 7472 6561 6d62 7566
3425240 205c 0067 6574 5f5f 3769 7374 7265 616d 4650 6369 6320 6765 745f 5f37 6973 7472 6561 6d46 5055 6369 6320 6765 745f 5f37
3425320 6973 7472 6561 6d46 5239 7374 7265 616d 6275 6663 2067 6574 5f5f 3769 7374 7265 616d 4652 5563 2067 6574 5f5f 3769 7374
3425400 7265 616d 4652 6320 6765 745f 5f37 6973 7472 6561 6d46 7620 6765 746c 696e 655f 5f37 6973 7472 6561 6d46 5063 6963 2067
3425460 6574 6c69 6e65 5f5f 3769 7374 7265 616d 4650 5563 6963 2070 6565 6b5f 5f37 6973 7472 6561 6d46 7620 6967 6e6f 7265 5f5f
3425540 3769 7374 7265 616d 4669 5431 205c 0072 6561 645f 5f37 6973 7472 6561 6d46 5063 6920 7265 6164 5f5f 3769 7374 7265 616d
3425620 4650 5563 6920 6763 6f75 6e74 5f5f 3769 7374 7265 616d 4676 2070 7574 6261 636b 5f5f 3769 7374 7265 616d 4663 2073 796e
3425700 635f 5f37 6973 7472 6561 6d46 7620 646f 5f69 7066 785f 5f37 6973 7472 6561 6d46 6920 6561 7477 6869 7465 5f5f 3769 7374
3425760 7265 616d 4676 2078 6765 745f 5f37 6973 7472 6561 6d46 5063 203b 3b3b 006f 7374 7265 616d 3a54 2830 2c32 3929 3d73 3638
3426040 5f5f 7670 7472 5f5f 376f 7374 7265 616d 3a28 302c 3333 292c 302c 3332 3b50 696f 733a 2830 2c33 3529 2c33 322c 3332 3b4f
3426120 696f 733a 2830 2c32 3629 2c36 342c 3438 303b 3b00 6f73 7472 6561 6d3a 5a63 6f73 7472 6561 6d3b 696f 733b 5f5f 6374 5f5f
3426200 376f 7374 7265 616d 4650 3973 7472 6561 6d62 7566 205f 5f63 745f 5f37 6f73 7472 6561 6d46 7620 5f5f 6374 5f5f 376f 7374
3426260 7265 616d 4669 205f 5f63 745f 5f37 6f73 7472 6561 6d46 6950 6320 5f5f 6374 5f5f 376f 7374 7265 616d 4652 376f 7374 7265
3426340 616d 205f 5f64 745f 5f37 6f73 7472 6561 6d46 7620 6f70 6678 5f5f 376f 7374 7265 616d 4676 206f 7366 785f 5f37 6f73 7472
3426420 6561 6d46 7620 666c 7573 685f 5f37 6f73 7472 6561 6d46 7620 5c00 7365 656b 705f 5f37 6f73 7472 6561 6d46 6c20 7365 656b
3426500 705f 5f37 6f73 7472 6561 6d46 6c38 7365 656b 5f64 6972 2074 656c 6c70 5f5f 376f 7374 7265 616d 4676 2070 7574 5f5f 376f
3426560 7374 7265 616d 4663 205f 5f6c 735f 5f37 6f73 7472 6561 6d46 6320 5f5f 6c73 5f5f 376f 7374 7265 616d 4655 6320 5f5f 6c73
3426640 5f5f 376f 7374 7265 616d 4650 4363 205f 5f6c 735f 5f37 6f73 7472 6561 6d46 6920 5f5f 6c73 5f5f 376f 7374 7265 616d 466c

| | | | | | | | | | | | | | | | | | | | | | | | | |
|---|---|---|---|---|---|---|---|---|---|---|---|---|---|---|---|---|---|---|---|---|---|---|---|---|
| 3426720 | 205f | 5f6c | 735f | 5f37 | 6f73 | 7472 | 6561 | 6d46 | 6420 | 5f5f | 6c73 | 5f5f | 376f | 7374 | 7265 | 616d | 4666 | 205c | 005f | 5f6c | 735f | 5f37 | 6f73 | 7472 |
| 3427000 | 6561 | 6d46 | 5569 | 205f | 5f6c | 735f | 5f37 | 6f73 | 7472 | 6561 | 6d46 | 556c | 205f | 5f6c | 735f | 5f37 | 6f73 | 7472 | 6561 | 6d46 | 5076 | 205f | 5f6c | 735f |
| 3427060 | 5f37 | 6f73 | 7472 | 6561 | 6d46 | 5039 | 7374 | 7265 | 616d | 6275 | 6620 | 5f5f | 6c73 | 5f5f | 376f | 7374 | 7265 | 616d | 4673 | 205f | 5f6c | 735f | 5f37 | 6f73 |
| 3427140 | 7472 | 6561 | 6d46 | 5573 | 205f | 5f6c | 735f | 5f37 | 6f73 | 7472 | 6561 | 6d46 | 5046 | 5237 | 6f73 | 7472 | 6561 | 6d5f | 5237 | 6f73 | 7472 | 6561 | 6d20 | 5f5f |
| 3427220 | 6c73 | 5f5f | 376f | 7374 | 7265 | 616d | 4650 | 4652 | 3369 | 6f73 | 5f52 | 3369 | 6f73 | 2077 | 7269 | 7465 | 5f5f | 376f | 7374 | 7265 | 616d | 4650 | 4363 | 6920 |
| 3427300 | 5c00 | 7772 | 6974 | 655f | 5f37 | 6f73 | 7472 | 6561 | 6d46 | 5043 | 5563 | 6920 | 646f | 5f6f | 7066 | 785f | 5f37 | 6f73 | 7472 | 6561 | 6d46 | 7620 | 646f | 5f6f |
| 3427360 | 7366 | 785f | 5f37 | 6f73 | 7472 | 6561 | 6d46 | 7620 | 3b3b | 3b00 | 7075 | 745f | 5f37 | 6f73 | 7472 | 6561 | 6d46 | 633a | 6628 | 302c | 3336 | 293d | 2a28 | 302c |
| 3427440 | 3239 | 2900 | 5f5f | 3074 | 6869 | 733a | 7028 | 302c | 3336 | 2900 | 5f5f | 3063 | 3a70 | 2830 | 2c32 | 2900 | 2f75 | 7372 | 2f43 | 432f | 7375 | 6e34 | 2f69 | 6e63 |
| 3427520 | 6c2f | 696f | 7374 | 7265 | 616d | 2e68 | 005f | 5f30 | 7468 | 6973 | 3a72 | 2830 | 2c33 | 3629 | 005f | 5f30 | 7468 | 6973 | 203a | 5a74 | 6c00 | 5f5f | 3063 | 203a |
| 3427600 | 5a74 | 6c00 | 7075 | 745f | 5f37 | 6f73 | 7472 | 6561 | 6d46 | 6320 | 3a5a | 7446 | 0069 | 6f73 | 7472 | 6561 | 6d3a | 5428 | 302c | 3337 | 293d | 7338 | 3078 | 5f67 |
| 3427660 | 636f | 756e | 745f | 5f37 | 6973 | 7472 | 6561 | 6d3a | 2830 | 2c31 | 292c | 302c | 3332 | 3b5f | 5f76 | 7074 | 725f | 5f37 | 6973 | 7472 | 6561 | 6d3a | 2830 | 2c33 |
| 3427740 | 3329 | 2c33 | 322c | 3332 | 3b50 | 696f | 733a | 2830 | 2c33 | 3529 | 2c36 | 342c | 3332 | 3b4f | 6f73 | 7472 | 6561 | 6d3a | 2830 | 2c32 | 3929 | 2c39 | 362c | 3534 |
| 3430020 | 343b | 3b00 | 696f | 7374 | 7265 | 616d | 3a5a | 6369 | 6f73 | 7472 | 6561 | 6d3b | 6973 | 7472 | 6561 | 6d20 | 6f73 | 7472 | 6561 | 6d20 | 696f | 733b | 5f5f | 6374 |
| 3430100 | 5f5f | 3869 | 6f73 | 7472 | 6561 | 6d46 | 5039 | 7374 | 7265 | 616d | 6275 | 6620 | 5f5f | 6374 | 5f5f | 3869 | 6f73 | 7472 | 6561 | 6d46 | 7620 | 5f5f | 6374 | 5f5f |
| 3430160 | 3869 | 6f73 | 7472 | 6561 | 6d46 | 5238 | 696f | 7374 | 7265 | 616d | 205f | 5f64 | 745f | 5f39 | 696f | 7374 | 7265 | 616d | 4676 | 203b | 3b3b | 0063 | 696e | 3a47 |
| 3430240 | 2830 | 2c33 | 3829 | 3178 | 7369 | 7374 | 7265 | 616d | 5f77 | 6974 | 6861 | 7373 | 6967 | 6e3a | 0063 | 6f75 | 743a | 4728 | 302c | 3339 | 293d | 7873 | 6f73 | 7472 |
| 3430320 | 6561 | 6d5f | 7769 | 7468 | 6173 | 7369 | 676e | 3a00 | 6365 | 7272 | 3a47 | 2830 | 2c33 | 3929 | 0063 | 6c6f | 673a | 4728 | 302c | 3339 | 2900 | 496f | 7374 | 7265 |
| 3430400 | 616d | 5f69 | 6e69 | 743a | 5428 | 302c | 3430 | 293d | 7331 | 5f5f | 5739 | 5f5f | 3133 | 496f | 7374 | 7265 | 616d | 5f69 | 6e69 | 743a | 2830 | 2c32 | 292c | 302c |
| 3430460 | 383b | 3b00 | 7374 | 6473 | 7461 | 7475 | 735f | 5f31 | 3349 | 6f73 | 7472 | 6561 | 6d5f | 696e | 6974 | 3a47 | 2830 | 2c31 | 2900 | 696e | 6974 | 636f | 756e | 745f |
| 3430540 | 5f31 | 3349 | 6f73 | 7472 | 6561 | 6d5f | 696e | 6974 | 3a47 | 2830 | 2c31 | 2900 | 496f | 7374 | 7265 | 616d | 5f69 | 6e69 | 743a | 5a63 | 496f | 7374 | 7265 | 616d |
| 3430620 | 5f69 | 6e69 | 743b | 3b5f | 5f63 | 745f | 5f31 | 3349 | 6f73 | 7472 | 6561 | 6d5f | 696e | 6974 | 4676 | 205f | 5f64 | 745f | 5f31 | 3349 | 6f73 | 7472 | 6561 | 6d5f |
| 3430700 | 696e | 6974 | 4676 | 203b | 7374 | 6473 | 7461 | 7475 | 735f | 5f31 | 3349 | 6f73 | 7472 | 6561 | 6d5f | 696e | 6974 | 2069 | 6e69 | 7463 | 6f75 | 6e74 | 5f5f | 3133 |
| 3430760 | 496f | 7374 | 7265 | 616d | 5f69 | 6e69 | 7420 | 3b40 | 696f | 733b | 0069 | 6f73 | 7472 | 6561 | 6d5f | 696e | 6974 | 3a53 | 2830 | 2c34 | 3029 | 0047 | 5054 | 3a74 |
| 3431040 | 2830 | 2c31 | 3329 | 0073 | 6d61 | 6e69 | 705f | 696e | 743a | 5428 | 302c | 3431 | 293d | 7338 | 6663 | 745f | 5f31 | 3073 | 6d61 | 6e69 | 705f | 696e | 743a | 2830 |
| 3431120 | 2c34 | 3229 | 3d2a | 2830 | 2c34 | 3329 | 3d66 | 2830 | 2c33 | 3529 | 2c30 | 2c33 | 323b | 6172 | 675f | 5f31 | 3073 | 6d61 | 6e69 | 705f | 696e | 743a | 2830 | 2c31 |
| 3431200 | 292c | 3332 | 2c33 | 323b | 3b00 | 736d | 616e | 6970 | 5f69 | 6e74 | 3a5a | 6373 | 6d61 | 6e69 | 705f | 696e | 743b | 3b5f | 5f63 | 745f | 5f31 | 3073 | 6d61 | 6e69 |
| 3431260 | 705f | 696e | 7446 | 5046 | 5233 | 696f | 7369 | 5f52 | 3369 | 6f73 | 6920 | 3b3b | 5f5f | 6c73 | 5f5f | 4652 | 376f | 7374 | 7265 | 616d | 5231 | 3073 | 6d61 | 6e69 |
| 3431340 | 705f | 696e | 7420 | 5f5f | 7273 | 5f5f | 4652 | 3769 | 7374 | 7265 | 616d | 5231 | 3073 | 6d61 | 6e69 | 705f | 696e | 7420 | 3b00 | 7361 | 7070 | 6c79 | 5f69 | 6e74 |
| 3431420 | 3a54 | 2830 | 2c34 | 3429 | 3d73 | 3466 | 6374 | 5f5f | 3130 | 7361 | 7070 | 6c79 | 5f69 | 6e74 | 3a28 | 302c | 3432 | 292c | 302c | 3332 | 3b3b | 0073 | 6170 | 706c |
| 3431500 | 795f | 696e | 743a | 5a63 | 7361 | 7070 | 6c79 | 5f69 | 6e74 | 3b3b | 5f5f | 6374 | 5f5f | 3130 | 7361 | 7070 | 6c79 | 5f69 | 6e74 | 4650 | 4652 | 3369 | 6f73 | 695f |
| 3431560 | 5233 | 696f | 7320 | 5f5f | 636c | 5f5f | 3130 | 7361 | 7070 | 6c79 | 5f69 | 6e74 | 4669 | 203b | 3b3b | 0069 | 6d61 | 6e69 | 705f | 696e | 743a | 5428 | 302c | 3435 |
| 3431640 | 293d | 7338 | 6663 | 745f | 5f31 | 3069 | 6d61 | 6e69 | 705f | 696e | 743a | 2830 | 2c34 | 3629 | 3d2a | 2830 | 2c34 | 3729 | 3d66 | 2830 | 2c34 | 3829 | 3d2a | 2830 |
| 3431720 | 2c33 | 3429 | 2c30 | 2c33 | 323b | 6172 | 675f | 5f31 | 3069 | 6d61 | 6e69 | 705f | 696e | 743a | 2830 | 2c31 | 292c | 3332 | 2c33 | 323b | 3b00 | 696d | 616e | 6970 |
| 3432000 | 5f69 | 6e74 | 3a5a | 6369 | 6d61 | 6e69 | 705f | 696e | 743b | 3b5f | 5f63 | 745f | 5f31 | 3069 | 6d61 | 6e69 | 705f | 696e | 7446 | 5046 | 5237 | 6973 | 7472 | 6561 |
| 3432060 | 6d69 | 5f52 | 3769 | 7374 | 7265 | 616d | 6920 | 3b3b | 5f5f | 7273 | 5f5f | 4652 | 3769 | 7374 | 7265 | 616d | 5231 | 3069 | 6d61 | 6e69 | 705f | 696e | 7420 | 3b00 |
| 3432140 | 6961 | 7070 | 6c79 | 5f69 | 6e74 | 3a54 | 2830 | 2c34 | 3929 | 3d73 | 3466 | 6374 | 5f5f | 3130 | 6961 | 7070 | 6c79 | 5f69 | 6e74 | 3a28 | 302c | 3436 | 292c | 302c |
| 3432220 | 3332 | 3b3b | 0069 | 6170 | 706c | 795f | 696e | 743a | 5a63 | 6961 | 7070 | 6c79 | 5f69 | 6e74 | 3b3b | 5f5f | 6374 | 5f5f | 3130 | 6961 | 7070 | 6c79 | 5f69 | 6e74 |
| 3432300 | 4650 | 4652 | 3769 | 7374 | 7265 | 616d | 695f | 5237 | 6973 | 7472 | 6561 | 6d20 | 5f5f | 636c | 5f5f | 3130 | 6961 | 7070 | 6c79 | 5f69 | 6e74 | 4669 | 203b | 3b3b |
| 3432360 | 006f | 6d61 | 6e69 | 705f | 696e | 743a | 5428 | 302c | 3530 | 293d | 7338 | 6663 | 745f | 5f31 | 306f | 6d61 | 6e69 | 705f | 696e | 743a | 2830 | 2c35 | 3129 | 3d2a |
| 3432440 | 2830 | 2c35 | 3229 | 3466 | 2830 | 2c33 | 3629 | 2c30 | 2c33 | 323b | 6172 | 675f | 5f31 | 306f | 6d61 | 6e69 | 705f | 696e | 743a | 2830 | 2c31 | 292c | 3332 | 2c33 |
| 3432520 | 323b | 3b00 | 6f6d | 616e | 6970 | 5f69 | 6e74 | 3a5a | 636f | 6d61 | 6e69 | 705f | 696e | 743b | 3b5f | 5f63 | 745f | 5f31 | 306f | 6d61 | 6e69 | 705f | 696e | 7446 |
| 3432600 | 5046 | 5237 | 6f73 | 7472 | 6561 | 6d69 | 5f52 | 376f | 7374 | 7265 | 616d | 6920 | 3b3b | 5f5f | 6c73 | 5f5f | 4652 | 376f | 7374 | 7265 | 616d | 5231 | 306f | 6d61 |
| 3432660 | 6e69 | 705f | 696e | 7420 | 3b00 | 6f61 | 7070 | 6c79 | 5f69 | 6e74 | 3a54 | 2830 | 2c35 | 3329 | 3d73 | 3466 | 6374 | 5f5f | 3130 | 6f61 | 7070 | 6c79 | 5f69 | 6e74 |
| 3432740 | 3a28 | 302c | 3531 | 292c | 302c | 3332 | 3b3b | 006f | 6170 | 706c | 795f | 696e | 743a | 5a63 | 6f61 | 7070 | 6c79 | 5f69 | 6e74 | 3b3b | 5f5f | 6374 | 5f5f | 3130 |
| 3433020 | 6f61 | 7070 | 6c79 | 5f69 | 6e74 | 4650 | 4652 | 376f | 7374 | 7265 | 616d | 695f | 5237 | 6f73 | 7472 | 6561 | 6d20 | 5f5f | 636c | 5f5f | 3130 | 6f61 | 7070 | 6c79 |
| 3433100 | 5f69 | 6e74 | 4669 | 203b | 3b3b | 0069 | 6f6d | 616e | 6970 | 5f69 | 6e74 | 3a54 | 2830 | 2c35 | 3429 | 3d73 | 3866 | 6374 | 5f5f | 3131 | 696f | 6d61 | 6e69 | 705f |
| 3433160 | 696e | 743a | 2830 | 2c35 | 3529 | 3d2a | 2830 | 2c35 | 3629 | 3d66 | 2830 | 2c35 | 3729 | 3d2a | 2830 | 2c33 | 3729 | 2c30 | 2c33 | 323b | 6172 | 675f | 5f31 | 3169 |
| 3433240 | 6f6d | 616e | 6970 | 5f69 | 6e74 | 3a28 | 302c | 3129 | 2c33 | 322c | 3332 | 3b3b | 0069 | 6f6d | 616e | 6970 | 5f69 | 6e74 | 3a5a | 6369 | 6f6d | 616e | 6970 | 5f69 |
| 3433320 | 6e74 | 3b3b | 5f5f | 6374 | 5f5f | 3131 | 696f | 6d61 | 6e69 | 705f | 696e | 7446 | 5046 | 5238 | 696f | 7374 | 7265 | 616d | 695f | 5238 | 696f | 7374 | 7265 | 616d |
| 3433400 | 6920 | 3b3b | 5f5f | 6c73 | 5f5f | 4652 | 3869 | 6f73 | 7472 | 6561 | 6d52 | 3131 | 696f | 6d61 | 6e69 | 705f | 696e | 7420 | 5f5f | 7273 | 5f5f | 4652 | 3869 | 6f73 |
| 3433460 | 7472 | 6561 | 6d52 | 3131 | 696f | 6d61 | 6e69 | 705f | 696e | 7420 | 3b00 | 696f | 6170 | 706c | 795f | 696e | 743a | 5428 | 302c | 3538 | 293d | 7334 | 6663 | 745f |
| 3433540 | 5f31 | 3169 | 6f61 | 7070 | 6c79 | 5f69 | 6e74 | 3a28 | 302c | 3535 | 292c | 302c | 3332 | 3b3b | 0069 | 6f61 | 7070 | 6c79 | 5f69 | 6e74 | 3a5a | 6369 | 6f61 | 7070 |
| 3433620 | 6c79 | 5f69 | 6e74 | 3b3b | 5f5f | 6374 | 5f5f | 3131 | 696f | 6170 | 706c | 795f | 696e | 7446 | 5046 | 5238 | 696f | 7374 | 7265 | 616d | 695f | 5238 | 696f | 7374 |
| 3433700 | 7265 | 616d | 205f | 5f63 | 6c5f | 5f31 | 3169 | 6f61 | 7070 | 6c79 | 5f69 | 6e74 | 4669 | 203b | 3b3b | 0073 | 6d61 | 6e69 | 705f | 6c6f | 6e67 | 3a54 | 2830 | 2c35 |
| 3433760 | 3929 | 3d73 | 3866 | 6374 | 5f5f | 3131 | 736d | 616e | 6970 | 5f6c | 6f6e | 673a | 2830 | 2c34 | 3229 | 2c30 | 2c33 | 323b | 6172 | 675f | 5f31 | 3173 | 6d61 | 6e69 |

```
3434040  705f 6c6f 6e67 3a28 302c 3129 2c33 322c 3332 3b3b 0073 6d61 6e69 705f 6c6f 6e67 3a5a 6373 6d61 6e69 705f 6c6f 6e67 3b3b
3434120  5f5f 6374 5f5f 3131 736d 616e 6970 5f6c 6f6e 6746 5046 5233 696f 736c 5f52 3369 6f73 6c20 3b3b 5f5f 6c73 5f5f 4652 376f
3434200  7374 7265 616d 5231 3173 6d61 6e69 705f 6c6f 6e67 205f 5f72 735f 5f46 5237 6973 7472 6561 6d52 3131 736d 616e 6970 5f6c
3434260  6f6e 6720 3b00 7361 7070 6c79 5f6c 6f6e 673a 5428 302c 3630 293d 7334 6663 745f 5f31 3173 6170 706c 795f 6c6f 6e67 3a28
3434340  302c 3432 292c 302c 3332 3b3b 0073 6170 706c 775f 6c6f 6e67 3a5a 6373 6170 706c 795f 6c6f 6e67 3b3b 5f5f 6374 5f5f 3131
3434420  7361 7070 6c79 5f6c 6f6e 6746 5046 5233 696f 736c 5f52 3369 6f73 205f 5f63 6c5f 5f31 3173 6170 706c 795f 6c6f 6e67 466c
3434500  203b 3b3b 0069 6161 6e69 705f 6c6f 6e67 3a54 2830 2c36 3129 3d73 3866 6374 5f5f 3131 696d 616e 6970 5f6c 6f6e 673a 2830
3434560  2c34 3629 2c30 2c33 323b 6172 675f 5f31 3169 6161 6e69 705f 6c6f 6e67 3a28 302c 3129 2c33 322c 3332 3b3b 0069 6d61 6e69
3434640  705f 6c6f 6e67 3a5a 6369 6d61 6e69 705f 6c6f 6e67 3b3b 5f5f 6374 5f5f 3131 696d 616e 6970 5f6c 6f6e 6746 5046 5237 6973
3434720  7472 6561 6d6c 5f52 3769 7374 7265 616d 6c20 3b3b 5f5f 7273 5f5f 4652 3769 7374 7265 616d 5231 3169 6d61 6e69 705f 6c6f
3435000  6e67 203b 0069 6170 706c 795f 6c6f 6e67 3a54 2830 2c36 3229 3d73 3466 6374 5f5f 3131 6961 7070 6c79 5f6c 6f6e 673a 2830
3435060  2c34 3629 2c30 2c33 323b 3b00 6961 7070 6c79 5f6c 6f6e 673a 5a63 6961 7070 6c79 5f6c 6f6e 673b 3b5f 5f63 745f 5f31 3169
3435140  6170 706c 795f 6c6f 6e67 4650 4652 3769 7374 7265 616d 6c5f 5237 6973 7472 6561 6d20 5f5f 636c 5f5f 3131 6961 7070 6c79
3435220  5f6c 6f6e 6746 6c20 3b3b 3b00 6f6d 616e 6970 5f6c 6f6e 673a 5428 302c 3633 293d 7338 6663 745f 5f31 316f 6d61 6e69 705f
3435300  6c6f 6e67 3a28 302c 3531 292c 302c 3332 3b61 7267 5f5f 3131 6f6d 616e 6970 5f6c 6f6e 673a 2830 2c31 292c 3332 2c33 323b
3435360  3b00 6f6d 616e 6970 5f6c 6f6e 673a 5a63 6f6d 616e 6970 5f6c 6f6e 673b 3b5f 5f63 745f 5f31 316f 6d61 6e69 705f 6c6f 6e67
3435440  4650 4652 376f 7374 7265 6161 6c5f 5237 6f73 7472 6561 6d6c 203b 3b5f 5f6c 735f 5f46 5237 6f73 7472 6561 6d52 3131 6f6d
3435520  616e 6970 5f6c 6f6e 6720 3b00 6f61 7070 6c79 5f6c 6f6e 673a 5428 302c 3634 293d 7334 6663 745f 5f31 316f 6170 706c 795f
3435600  6c6f 6e67 3a28 302c 3531 292c 302c 3332 3b3b 006f 6170 706c 795f 6c6f 6e67 3a5a 636f 6170 706c 795f 6c6f 6e67 3b3b 5f5f
3435660  6374 5f5f 3131 6f61 7070 6c79 5f6c 6f6e 6746 5046 5237 6f73 7472 6561 6d6c 5f52 376f 7374 7265 616d 205f 5f63 6c5f 5f31
3435740  316f 6170 706c 795f 6c6f 6e67 466c 203b 3b3b 0069 6f6d 616e 6970 5f6c 6f6e 673a 5428 302c 3635 293d 7338 6663 745f 5f31
3436020  3269 6f6d 616e 6970 5f6c 6f6e 673a 2830 2c35 3529 2c30 2c33 323b 6172 675f 5f31 3269 6f6d 616e 6970 5f6c 6f6e 673a 2830
3436100  2c31 292c 3332 2c33 323b 3b00 696f 6d61 6e69 705f 6c6f 6e67 3a5a 6369 6f6d 616e 6970 5f6c 6f6e 673b 3b5f 5f63 745f 5f31
3436160  3269 6f6d 616e 6970 5f6c 6f6e 6746 5046 5238 696f 7374 7265 616d 6c5f 5238 696f 7374 7265 616d 6c20 3b3b 5f5f 6c73 5f5f
3436240  4652 3869 6f73 7472 6561 6d52 3132 696f 6161 6e69 705f 6c6f 6e67 205f 5f72 735f 5f46 5238 696f 7374 7265 616d 5231 3269
3436320  6f6d 616e 6970 5f6c 6f6e 6720 3b00 696f 6170 706c 795f 6c6f 6e67 3a54 2830 2c36 3629 3d73 3466 6374 5f5f 3132 696f 6170
3436400  706c 795f 6c6f 6e67 3a28 302c 3535 292c 302c 3332 3b3b 0069 6f61 7070 6c79 5f6c 6f6e 673a 5a63 696f 6170 706c 795f 6c6f
3436460  6e67 3b3b 5f5f 6374 5f5f 3132 696f 6170 706c 795f 6c6f 6e67 4650 4652 3869 6f73 7472 6561 6d6c 5f52 3869 6f73 7472 6561
3436540  6d20 5f5f 636c 5f5f 3132 696f 6170 706c 795f 6c6f 6e67 466c 203b 3b3b 0073 7464 696f 6275 663a 5428 302c 3637 293d 7335
3436620  3261 6c6c 6f63 5f5f 3973 7472 6561 6d62 7566 3a29 302c 3429 2c30 2c31 363b 785f 756e 6275 665f 5f39 7374 7265 616d 6275
3436700  663a 2830 2c34 292c 3136 2c31 363b 785f 6261 7365 5f5f 3973 7472 6561 6d62 7566 3a28 302c 3230 292c 3332 2c33 323b 785f
3436760  7062 6173 655f 5f39 7374 7265 616d 6275 663a 2830 2c32 3029 2c36 342c 3332 3b78 5f70 7074 725f 5f39 7374 7265 616d 6275
3437040  663a 2830 2c32 3029 2c39 362c 3332 3b78 5f65 7070 7472 5f5f 3973 7472 6561 6d62 7566 3a28 302c 3230 292c 3132 382c 3332
3437120  3b78 5f67 7074 725f 5f39 7374 7265 616d 6275 663a 2830 2c32 3029 2c31 3630 2c33 323b 785f 6567 7074 725f 5f39 7374 7265
3437200  616d 6275 663a 2830 2c32 3029 2c31 3932 2c33 323b 5c00 785f 6562 6163 6b5f 5f39 7374 7265 616d 6275 663a 2830 2c32 3029
3437260  2c32 3234 2c33 323b 785f 626c 656e 5f5f 3973 7472 6561 6462 7566 3a28 302c 3129 2c32 3536 2c33 323b 5f5f 7670 7472 5f5f
3437340  3973 7472 6561 6462 7566 3a28 302c 3333 292c 3238 382c 3332 3b66 705f 5f38 7374 6469 6f62 7566 3a28 302c 3638 293d 2a28
3437420  302c 3138 293d 7873 5f69 6f62 7566 3a2c 3332 302c 3332 3b6c 6173 745f 6f70 5f5f 3873 7464 696f 6275 663a 2830 2c31 292c
3437500  3335 322c 3332 3b62 7566 5f5f 3873 7464 696f 6275 663a 2830 2c36 3929 3d61 7228 302c 3129 3b30 3b31 3b28 302c 3229 2c33
3437560  3834 2c31 363b 3b00 7374 6469 6f62 7566 3a5a 6373 7464 696f 6275 663b 7374 7265 616d 6275 663b 6f76 6572 666c 6f77 5f5f
3437640  3873 7464 696f 6275 6646 6920 756e 6465 7266 6c6f 775f 5f38 7374 6469 6f62 7566 4676 2073 796e 635f 5f38 7374 6469 6f62
3437720  7566 4676 2073 6565 6b6f 6666 5f5f 3873 7464 696f 6275 6646 6c38 7365 656b 5f64 6972 6920 7062 6163 6b66 6169 6c5f 5f38
3440000  7374 6469 6f62 7566 4669 205f 5f63 745f 5f38 7374 6469 6f62 7566 4650 365f 696f 6275 6620 5f5f 6374 5f5f 3873 7464 696f
3440060  6275 6646 5243 3373 7464 696f 6275 6620 5c00 7374 6469 6f66 696c 655f 5f38 7374 6469 6f62 7566 4676 205f 5f64 745f 5f38
3440140  7374 6469 6f62 7566 4676 203b 3b3b 0066 696c 6562 7566 3a54 2830 2c37 3029 3d73 3634 616c 6c6f 635f 5f39 7374 7265 616d
3440220  6275 663a 2830 2c34 292c 302c 3136 3b78 5f75 6e62 7566 5f5f 3973 7472 6561 6d62 7566 3a28 302c 3429 2c31 362c 3136 3b78
3440300  5f62 6173 655f 5f39 7374 7265 616d 6275 663a 2830 2c32 3029 2c33 322c 3332 3b78 5f70 6261 7365 5f5f 3973 7472 6561 6d62
3440360  7566 3a28 302c 3230 292c 3634 2c33 323b 785f 7070 7472 5f5f 3973 7472 6561 6d62 7566 3a28 302c 3230 292c 3936 2c33 323b
3440440  785f 6570 7074 725f 5f39 7374 7265 616d 6275 663a 2830 2c32 3029 2c31 3238 2c33 323b 785f 6770 7472 5f5f 3973 7472 6561
3440520  6d62 7566 3a28 302c 3230 292c 3136 302c 3332 3b78 5f65 6770 7472 5f5f 3973 7472 6561 6d62 7566 3a28 302c 3230 292c 3139
3440600  322c 3332 3b5c 0078 5f65 6261 636b 5f5f 3973 7472 6561 6d62 7566 3a28 302c 3230 292c 3232 342c 3332 3b78 5f62 6c65 6e5f
3440660  5f39 7374 7265 616d 6275 663a 2830 2c31 292c 3235 362c 3332 3b5f 5f76 7074 725f 5f39 7374 7265 616d 6275 663a 2830 2c33
3440740  3329 2c32 3838 2c33 323b 7866 645f 5f37 6669 6c65 6275 663a 2830 2c31 292c 3332 302c 3332 3b6d 6f64 655f 5f37 6669 6c65
3441020  6275 663a 2830 2c31 292c 3335 322c 3332 3b6f 7065 6e65 645f 5f37 6669 6c65 6275 663a 2830 2c32 292c 3338 342c 383b 6c61
3441100  7374 5f73 6565 6b5f 5f37 6669 6c65 6275 663a 2830 2c31 292c 3431 362c 3332 3b69 6e5f 7374 6172 745f 5f37 6669 6c65 6275
```

| | | | | | | | | | | | | | | | | | | | | | | | | |
|---|---|---|---|---|---|---|---|---|---|---|---|---|---|---|---|---|---|---|---|---|---|---|---|---|
| 3441160 | 663a | 2830 | 2c32 | 3029 | 2c34 | 3438 | 2c33 | 323b | 6c61 | 6865 | 6164 | 5f5f | 3766 | 696c | 6562 | 7566 | 3a28 | 302c | 3639 | 292c | 3438 | 302c | 3136 | 3b3b |
| 3441240 | 006f | 7065 | 6e70 | 726f | 745f | 5f37 | 6669 | 6c65 | 6275 | 663a | 4728 | 302c | 3129 | 0066 | 696c | 6562 | 7566 | 3a5a | 6366 | 696c | 6562 | 7566 | 3b73 | 7472 |
| 3441320 | 6561 | 6d62 | 7566 | 3b5f | 5f63 | 745f | 5f37 | 6669 | 6c65 | 6275 | 6646 | 7620 | 5f5f | 6374 | 5f5f | 3766 | 696c | 6562 | 7566 | 4669 | 205f | 5f63 | 745f | 5f37 |
| 3441400 | 6669 | 6c65 | 6275 | 6646 | 6950 | 6354 | 3120 | 5f5f | 6374 | 5f5f | 3766 | 696c | 6562 | 7566 | 4652 | 4337 | 6669 | 6c65 | 6275 | 6620 | 6973 | 5f6f | 7065 | 6e5f |
| 3441460 | 5f37 | 6669 | 6c65 | 6275 | 6646 | 7620 | 6664 | 5f5f | 3766 | 696c | 6562 | 7566 | 4676 | 206f | 7065 | 6e5f | 5f37 | 6669 | 6c65 | 6275 | 6646 | 5043 | 6369 | 5432 |
| 3441540 | 2061 | 7474 | 6163 | 685f | 5f37 | 6669 | 6c65 | 6275 | 6646 | 6920 | 636c | 6f73 | 655f | 5f37 | 6669 | 6c65 | 6275 | 6646 | 7620 | 5c00 | 5f5f | 6474 | 5f5f | 3766 |
| 3441620 | 696c | 6562 | 7566 | 4676 | 206f | 7665 | 7266 | 6c6f | 775f | 5f37 | 6669 | 6c65 | 6275 | 6646 | 6920 | 756e | 6465 | 7266 | 6c6f | 775f | 5f37 | 6669 | 6c65 | 6275 |
| 3441700 | 6646 | 7620 | 7379 | 6e63 | 5f5f | 3766 | 696c | 6562 | 7566 | 4676 | 2073 | 6565 | 6b6f | 6666 | 5f5f | 3766 | 696c | 6562 | 7566 | 466c | 3873 | 6565 | 6b5f | 6469 |
| 3441760 | 7269 | 2073 | 6574 | 6275 | 665f | 5f37 | 6669 | 6c65 | 6275 | 6646 | 5063 | 6920 | 6c61 | 7374 | 5f6f | 705f | 5f37 | 6669 | 6c65 | 6275 | 6646 | 7620 | 3b6f | 7065 |
| 3442040 | 6e70 | 726f | 745f | 5f37 | 6669 | 6c65 | 6275 | 6620 | 3b3b | 0066 | 7374 | 7265 | 616d | 6261 | 7365 | 3a54 | 2830 | 2c37 | 3129 | 3d73 | 3133 | 3262 | 7566 | 5f5f |
| 3442120 | 3131 | 6673 | 7472 | 6561 | 6d62 | 6173 | 653a | 2830 | 2c37 | 3029 | 2c30 | 2c35 | 3132 | 3b5f | 5f76 | 7074 | 725f | 5f31 | 3166 | 7374 | 7265 | 616d | 6261 | 7365 |
| 3442200 | 3a28 | 302c | 3333 | 292c | 3531 | 322c | 3332 | 3b50 | 696f | 733a | 2830 | 2c33 | 3529 | 2c35 | 3434 | 2c33 | 323b | 4f69 | 6f73 | 3a28 | 302c | 3236 | 292c | 3537 |
| 3442260 | 362c | 3438 | 303b | 3b00 | 6673 | 7472 | 6561 | 6d62 | 6173 | 653a | 5a63 | 6673 | 7472 | 6561 | 6d62 | 6173 | 653b | 696f | 733b | 5f5f | 6374 | 5f5f | 3131 | 6673 |
| 3442340 | 7472 | 6561 | 6d62 | 6173 | 6546 | 7620 | 5f5f | 6374 | 5f5f | 3131 | 6673 | 7472 | 6561 | 6d62 | 6173 | 6546 | 5043 | 6369 | 5432 | 205f | 5f63 | 745f | 5f31 | 3166 |
| 3442420 | 7374 | 7265 | 616d | 6261 | 7365 | 4669 | 205f | 5f63 | 745f | 5f31 | 3166 | 7374 | 7265 | 6161 | 6261 | 7365 | 4669 | 5063 | 5431 | 205f | 5f63 | 745f | 5f31 | 3166 |
| 3442500 | 7374 | 7265 | 616d | 6261 | 7365 | 4652 | 3131 | 6673 | 7472 | 6561 | 6d62 | 6173 | 6520 | 5f5f | 6474 | 5f5f | 3131 | 6673 | 7472 | 6561 | 6d62 | 6173 | 6546 | 7620 |
| 3442560 | 6f70 | 656e | 5f5f | 3131 | 6673 | 7472 | 6561 | 6d62 | 6173 | 6546 | 5043 | 6369 | 5432 | 205c | 0061 | 7474 | 6163 | 685f | 5f31 | 3166 | 7374 | 7265 | 616d | 6261 |
| 3442640 | 7365 | 4669 | 2063 | 6c6f | 7365 | 5f5f | 3131 | 6673 | 7472 | 6561 | 6d62 | 6173 | 6546 | 7620 | 7365 | 7462 | 7566 | 5f5f | 3131 | 6673 | 7472 | 6561 | 6d62 | 6173 |
| 3442720 | 6546 | 5063 | 6920 | 7264 | 6275 | 665f | 5f31 | 3166 | 7374 | 7265 | 616d | 6261 | 7365 | 4676 | 2076 | 6572 | 6966 | 795f | 5f31 | 3166 | 7374 | 7265 | 616d | 6261 |
| 3443000 | 7365 | 4669 | 203b | 3b3b | 0073 | 7461 | 7465 | 5f76 | 616c | 7565 | 3a74 | 2830 | 2c32 | 3129 | 0056 | 616c | 7565 | 5f54 | 7970 | 653a | 5428 | 302c | 3732 | 293d |
| 3443060 | 6555 | 4e4b | 4e4f | 574e | 563a | 302c | 5354 | 5249 | 4e47 | 3a31 | 2c49 | 4e54 | 4547 | 4552 | 3a32 | 2c46 | 4c4f | 4154 | 3a33 | 2c3b | 0042 | 6c6f | 636b | 5f54 |
| 3443140 | 7970 | 653a | 5428 | 302c | 3733 | 293d | 6555 | 4e4b | 4e4f | 574e | 423a | 302c | 454e | 5449 | 5459 | 3a31 | 2c46 | 554e | 4354 | 494f | 4e3a | 322c | 5052 | 4f43 |
| 3443220 | 4544 | 5552 | 453a | 332c | 3b00 | 456e | 7469 | 7479 | 5f54 | 7970 | 653a | 5428 | 302c | 3734 | 293d | 6555 | 4e4b | 4e4f | 574e | 453a | 302c | 4152 | 4348 | 4954 |
| 3443300 | 4543 | 5455 | 5245 | 3a31 | 2c53 | 5542 | 5052 | 4f47 | 5241 | 413a | 322c | 3b00 | 5069 | 6e5f | 5479 | 7065 | 3a54 | 2830 | 2c37 | 3529 | 3d65 | 554e | 4b4e | 4f57 |
| 3443360 | 4e50 | 3a30 | 2c49 | 4e50 | 494e | 3a31 | 2c4f | 5554 | 5049 | 4e3a | 322c | 494e | 4f55 | 5450 | 494e | 3a33 | 2c3b | 0050 | 6172 | 615f | 436c | 6173 | 733a | 5428 |
| 3443440 | 302c | 3736 | 293d | 6555 | 4e4b | 4e4f | 574e | 433a | 302c | 464f | 524d | 414c | 3a31 | 2c41 | 4354 | 5541 | 4c3a | 322c | 5245 | 534f | 4c56 | 4544 | 3a33 | 2c3b |
| 3443520 | 0042 | 4f4f | 4c45 | 414e | 3a54 | 2830 | 2c37 | 3729 | 3d65 | 4661 | 6c73 | 653a | 302c | 5472 | 7565 | 3a31 | 2c3b | 0042 | 6f6f | 6c65 | 616e | 3a54 | 2830 | 2c37 |
| 3443600 | 3829 | 3d65 | 6661 | 6c73 | 653a | 302c | 7472 | 7565 | 3a31 | 2c3b | 0042 | 7566 | 6665 | 723a | 4728 | 302c | 3230 | 2900 | 4f62 | 6a65 | 6374 | 3a54 | 2830 | 2c37 |
| 3443660 | 3929 | 3d73 | 345f | 5f76 | 7074 | 725f | 5f36 | 4f62 | 6a65 | 6374 | 3a28 | 302c | 3333 | 292c | 302c | 3332 | 3b3b | 004f | 626a | 6563 | 743a | 5a63 | 4f62 | 6a65 |
| 3443740 | 6374 | 3b3b | 5f5f | 6374 | 5f5f | 364f | 626a | 6563 | 7446 | 7620 | 5f5f | 6374 | 5f5f | 364f | 626a | 6563 | 7446 | 5243 | 364f | 626a | 6563 | 7420 | 6572 | 726f |
| 3444020 | 724d | 656d | 6f72 | 795f | 5f36 | 4f62 | 6a65 | 6374 | 4650 | 6354 | 3120 | 6578 | 706c | 6169 | 6e5f | 5f36 | 4f62 | 6a65 | 6374 | 4650 | 6320 | 696e | 4f72 | 6465 |
| 3444100 | 725f | 5f36 | 4f62 | 6a65 | 6374 | 4650 | 364f | 626a | 6563 | 7420 | 3b3b | 3b00 | 5f5f | 7074 | 626c | 5f5f | 364f | 626a | 6563 | 745f | 5f41 | 6464 | 6572 | 5f63 |
| 3444160 | 7878 | 3a47 | 2830 | 2c33 | 3329 | 0050 | 463a | 7428 | 302c | 3135 | 2900 | 5046 | 433a | 7428 | 302c | 3135 | 2900 | 5046 | 493a | 7428 | 302c | 3135 | 2900 | 4e4f |
| 3444240 | 626a | 6563 | 743a | 5428 | 302c | 3830 | 293d | 7338 | 5f5f | 7670 | 7472 | 5f5f | 364f | 626a | 6563 | 743a | 2830 | 2c33 | 3329 | 2c30 | 2c33 | 323b | 6e61 | 6d65 |
| 3444320 | 5f5f | 374e | 4f62 | 6a65 | 6374 | 3a28 | 302c | 3230 | 292c | 3332 | 2c33 | 323b | 3b00 | 4e4f | 626a | 6563 | 743a | 5a63 | 4e4f | 626a | 6563 | 743b | 4f62 | 6a65 |
| 3444400 | 6374 | 3b5f | 5f63 | 745f | 5f37 | 4e4f | 626a | 6563 | 7446 | 5063 | 205f | 5f63 | 745f | 5f37 | 4e4f | 626a | 6563 | 7446 | 5243 | 374e | 4f62 | 6a65 | 6374 | 2073 |
| 3444460 | 6574 | 4e61 | 6d65 | 5f5f | 374e | 4f62 | 6a65 | 6374 | 4650 | 6320 | 6765 | 744e | 616d | 655f | 5f37 | 4e4f | 626a | 6563 | 7446 | 7620 | 6578 | 706c | 6169 | 6e5f |
| 3444540 | 5f37 | 4e4f | 626a | 6563 | 7446 | 5063 | 2067 | 6574 | 4174 | 7472 | 5f5f | 374e | 4f62 | 6a65 | 6374 | 4669 | 2067 | 6574 | 5072 | 6f70 | 5f5f | 374e | 4f62 | 6a65 |
| 3444620 | 6374 | 4650 | 6369 | 2373 | 6574 | 5072 | 6f70 | 5f5f | 374e | 4f62 | 6a65 | 6374 | 4650 | 6354 | 3120 | 5c00 | 7365 | 7450 | 726f | 705f | 5f37 | 4e4f | 626a | 6563 |
| 3444700 | 7446 | 5063 | 6920 | 7365 | 7450 | 726f | 705f | 5f37 | 4e4f | 626a | 6563 | 7446 | 5063 | 6620 | 6973 | 4754 | 455f | 5f37 | 4e4f | 626a | 6563 | 7446 | 5036 | 4f62 |
| 3444760 | 6a65 | 6374 | 2069 | 734c | 5445 | 5f5f | 374e | 4f62 | 5a65 | 6374 | 4650 | 364f | 626a | 6563 | 7420 | 3b3b | 3b00 | 6f73 | 7472 | 6561 | 6d5f | 7769 | 7468 | 6173 |
| 3445040 | 7369 | 676e | 3a54 | 2830 | 2c33 | 3929 | 3d73 | 3638 | 5f5f | 7670 | 7472 | 5f5f | 376f | 7374 | 7265 | 616d | 3a28 | 302c | 3333 | 292c | 302c | 3332 | 3b50 | 696f |
| 3445120 | 733a | 2830 | 2c33 | 3529 | 2c33 | 322c | 3332 | 3b4f | 696f | 733a | 2830 | 2c32 | 3629 | 2c36 | 342c | 3438 | 303b | 3b00 | 6f73 | 7472 | 6561 | 6d5f | 7769 | 7468 |
| 3445200 | 6173 | 7369 | 676e | 3a5a | 636f | 7374 | 7265 | 616d | 5f77 | 6974 | 6861 | 7373 | 6967 | 6e3b | 6f73 | 7472 | 6561 | 6d20 | 696f | 733b | 5f5f | 6374 | 5f5f | 3138 |
| 3445260 | 6f73 | 7472 | 6561 | 6d5f | 7769 | 7468 | 6173 | 7369 | 676e | 4676 | 205f | 5f63 | 745f | 5f31 | 386f | 7374 | 7265 | 616d | 5f77 | 6974 | 6861 | 7373 | 6967 | 6e46 |
| 3445340 | 5231 | 386f | 7374 | 7265 | 616d | 5f77 | 6974 | 6861 | 7373 | 6967 | 6e20 | 5f5f | 6474 | 5f5f | 3138 | 6f73 | 7472 | 6561 | 6d5f | 7769 | 7468 | 6173 | 7369 | 676e |
| 3445420 | 4676 | 205f | 5f61 | 735f | 5f31 | 386f | 7374 | 7265 | 616d | 5f77 | 6974 | 6861 | 7373 | 6967 | 6e46 | 5237 | 6f73 | 7472 | 6561 | 6d20 | 5c00 | 5f5f | 6173 | 5f5f |
| 3445500 | 3138 | 6f73 | 7472 | 6561 | 6d5f | 7769 | 7468 | 6173 | 7369 | 676e | 4650 | 3973 | 7472 | 6561 | 6d62 | 7566 | 203b | 3b3b | 0050 | 4642 | 3a74 | 2830 | 2c31 | 3529 |
| 3445560 | 004c | 4e4f | 626a | 6563 | 743a | 5428 | 302c | 3831 | 293d | 7331 | 325f | 5f76 | 7074 | 725f | 5f36 | 4f62 | 6a65 | 6374 | 3a28 | 302c | 3333 | 292c | 302c | 3332 |
| 3445640 | 3b6e | 616d | 655f | 5f37 | 4e4f | 626a | 6563 | 743a | 2830 | 2c32 | 3029 | 2c33 | 322c | 3332 | 3b6e | 6578 | 745f | 5f38 | 4c4e | 4f62 | 6a65 | 6374 | 3a28 | 302c |
| 3445720 | 3832 | 293d | 2a28 | 302c | 3831 | 292c | 3634 | 2c33 | 323b | 3b00 | 4c4e | 4f62 | 6a65 | 6374 | 3a5a | 634c | 4e4f | 626a | 6563 | 743b | 4e4f | 626a | 6563 | 743b |
| 3446000 | 5f5f | 6374 | 5f5f | 384c | 4e4f | 626a | 6563 | 7446 | 5063 | 5038 | 4c4e | 4f62 | 6a65 | 6374 | 205f | 5f63 | 745f | 5f38 | 4c4e | 4f62 | 6a65 | 6374 | 4652 | 4338 |
| 3446060 | 4c4e | 4f62 | 6a65 | 6374 | 2073 | 6574 | 4e65 | 7874 | 5f5f | 384c | 4e4f | 626a | 6563 | 7446 | 5038 | 4c4e | 4f62 | 6a65 | 6374 | 2067 | 6574 | 4e65 | 7874 | 5f5f |
| 3446140 | 384c | 4e4f | 626a | 6563 | 7446 | 7620 | 3b3b | 3b00 | 4c4f | 626a | 6563 | 743a | 5428 | 302c | 3833 | 293d | 7338 | 5f5f | 7670 | 7472 | 5f5f | 364f | 626a | 6563 |
| 3446220 | 743a | 2830 | 2c33 | 3329 | 2c30 | 2c33 | 323b | 6e65 | 7874 | 5f5f | 374c | 4f62 | 6a65 | 6374 | 3a28 | 302c | 3834 | 293d | 2a28 | 302c | 3833 | 292c | 3332 | 2c33 |

```
3446300  323b 3b00 4c4f 626a 6563 743a 5a63 4c4f 626a 6563 743b 4f62 6a65 6374 3b5f 5f63 745f 5f37 4c4f 626a 6563 7446 5037 4c4f
3446360  626a 6563 7420 5f5f 6374 5f5f 374c 4f62 6a65 6374 4652 4337 4c4f 626a 6563 7420 7365 744e 6578 745f 5f37 4c4f 626a 6563
3446440  7446 5037 4c4f 626a 6563 7420 6765 744e 6578 745f 5f37 4c4f 626a 6563 7446 7620 3b3b 3b00 4c50 4f62 6a65 6374 3a54 2830
3446520  2c38 3529 3d73 3132 5f5f 7670 7472 5f5f 364f 626a 6563 743a 2830 2c33 3329 2c30 2c33 323b 6e65 7874 5f5f 374c 4f62 6a65
3446600  6374 3a28 302c 3834 292c 3332 2c33 323b 6e6f 626a 7074 725f 5f38 4c50 4f62 6a65 6374 3a28 302c 3836 293d 2a28 302c 3830
3446660  292c 3634 2c33 323b 3b00 4c50 4f62 6a65 6374 3a5a 634c 504f 626a 6563 743b 4c4f 626a 6563 743b 5f5f 6374 5f5f 384c 504f
3446740  626a 6563 7446 5037 4e4f 626a 6563 7450 374c 4f62 6a65 6374 205f 5f63 745f 5f38 4c50 4f62 6a65 6374 4652 4338 4c50 4f62
3447020  6a65 6374 2073 6574 4f62 6a65 6374 5f5f 384c 504f 626a 6563 7446 5037 4e4f 626a 6563 7420 6765 744f 626a 6563 745f 5f38
3447100  4c50 4f62 6a65 6374 4676 2065 7870 6c61 696e 5f5f 384c 504f 626a 6563 7446 5063 203b 3b3b 005f 5f70 7462 6c5f 5f38 4c50
3447160  4f62 6a65 6374 5f5f 4164 6465 725f 6378 783a 4728 302c 3333 2900 4c69 7374 3a54 2830 2c38 3729 3d73 3132 636f 756e 745f
3447240  5f34 4c69 7374 3a28 302c 3129 2c30 2c33 323b 7074 724c 4f62 6a65 6374 5f5f 344c 6973 743a 2830 2c38 3429 2c33 322c 3332
3447320  3b5f 5f76 7074 725f 5f34 4c69 7374 3a28 302c 3333 292c 3634 2c33 323b 3b00 4c69 7374 3a5a 634c 6973 743b 3b5f 5f63 745f
3447400  5f34 4c69 7374 4676 205f 5f63 745f 5f34 4c69 7374 4652 4334 4c69 7374 205f 5f64 745f 5f34 4c69 7374 4676 2067 6574 436f
3447460  756e 745f 5f34 4c69 7374 4676 2067 6574 546f 705f 5f34 4c69 7374 4676 2073 6574 546f 705f 5f34 4c69 7374 4650 374c 4f62
3447540  6a65 6374 2065 7272 6f72 4d65 6d6f 7279 5f5f 344c 6973 7446 5063 5431 2062 726f 6164 6361 7374 5f5f 344c 6973 7446 4d36
3447620  4f62 6a65 6374 4676 5f76 2065 7870 6c61 696e 5f5f 344c 6973 7446 5063 205c 0069 6e73 6572 745f 5f34 4c69 7374 4650 374c
3447700  4f62 6a65 6374 2069 734d 656d 6265 725f 5f34 4c69 7374 4650 374c 4f62 6a65 6374 2069 734d 656d 6265 725f 5f34 4c69 7374
3447760  4650 6320 6973 4571 7561 6c5f 5f34 4c69 7374 4652 344c 6973 7420 7265 6d6f 7665 5f5f 344c 6973 7446 5063 203b 3b3b 005f
3450040  5f70 7462 6c5f 5f34 4c69 7374 5f5f 4164 6465 725f 6378 783a 4728 302c 3333 2900 504c 6973 743a 5428 302c 3838 293d 7331
3450120  3263 6f75 6e74 5f5f 344c 6973 743a 2830 2c31 292c 302c 3332 3b70 7472 4c4f 626a 6563 745f 5f34 4c69 7374 3a28 302c 3834
3450200  292c 3332 2c33 323b 5f5f 7670 7472 5f5f 344c 6973 743a 2830 2c33 3329 2c36 342c 3332 3b3b 0050 4c69 7374 3a5a 6350 4c69
3450260  7374 3b4c 6973 743b 696e 7365 7274 5f5f 3550 4c69 7374 4650 384c 504f 626a 6563 7420 696e 7365 7274 5f5f 3550 4c69 7374
3450340  4652 3550 4c69 7374 2053 6f72 745f 504c 6973 745f 5f35 504c 6973 7446 6920 7265 7665 7273 655f 5f35 504c 6973 7446 7620
3450420  696e 7365 7274 4166 7465 725f 5f35 504c 6973 7446 5038 4c50 4f62 6a65 6374 5431 2072 656d 6f76 655f 5f35 504c 6973 7446
3450500  5038 4c50 4f62 6a65 6374 2072 656d 6f76 655f 5f35 504c 6973 7446 5063 2069 734d 656d 6265 725f 5f35 504c 6973 7446 5063
3450560  205c 0069 734d 656d 6265 725f 5f35 504c 6973 7446 5037 4c4f 626a 6563 7420 6973 4571 7561 6c5f 5f35 504c 6973 7446 5234
3450640  4c69 7374 2065 7470 6c61 696e 5f5f 3550 4c69 7374 4650 6320 5f5f 6374 5f5f 3550 4c69 7374 4652 4335 504c 6973 7420 5f5f
3450720  6374 5f5f 3550 4c69 7374 4676 203b 3b3b 005f 5f70 7462 6c5f 5f35 504c 6973 745f 5f41 6464 6572 5f63 7878 3a47 2830 2c33
3451000  3329 004c 6973 7449 7465 7261 746f 723a 5428 302c 3839 293d 7338 6c69 7374 5f5f 3132 4c69 7374 4974 6572 6174 6f72 3a28
3451060  302c 3930 293d 2a28 302c 3837 292c 302c 3332 3b70 5f5f 3132 4c69 7374 4974 6572 6174 6f72 3a28 302c 3834 292c 3332 2c33
3451140  323b 3b00 4c69 7374 4974 6572 6174 6f72 3a5a 634c 6973 7449 7465 7261 746f 723b 3b5f 5f63 745f 5f31 324c 6973 7449 7465
3451220  7261 746f 7246 5234 4c69 7374 2072 6573 6574 5f5f 3132 4c69 7374 4974 6572 6174 6f72 4676 2061 7474 6163 685f 5f31 324c
3451300  6973 7449 7465 7261 746f 7246 5234 4c69 7374 2067 6574 4375 7272 656e 745f 5f31 324c 6973 7449 7465 7261 746f 7246 7620
3451360  5f5f 7070 5f5f 3132 4c69 7374 4974 6572 6174 6f72 4676 203b 3b3b 0050 696e 4c65 6e67 7468 3a54 2830 2c39 3129 3d73 3136
3451440  5f5f 7670 7472 5f5f 364f 626a 6563 743a 2830 2c33 3329 2c30 2c33 323b 6e61 6d65 5f5f 374e 4f62 6a65 6374 3a28 302c 3230
3451520  292c 3332 2c33 323b 436c 656e 6774 685f 5f39 5069 6e4c 656e 6774 683a 2830 2c32 3029 2c36 342c 3332 3b49 6c65 6e67 7468
3451600  5f5f 3950 696e 4c65 6e67 7468 3a28 302c 3129 2c39 362c 3332 3b3b 0050 696e 4c65 6e67 7468 3a5a 6350 696e 4c65 6e67 7468
3451660  3b4e 4f62 6a65 6374 3b5f 5f63 745f 5f39 5069 6e4c 656e 6774 6846 5063 5431 205f 5f63 745f 5f39 5069 6e4c 656e 6774 6846
3451740  5243 3950 696e 4c65 6e67 7468 2073 6574 5f50 696e 4c65 6e67 7468 5f5f 3950 696e 4c65 6e67 7468 4650 6354 3120 6765 745f
3452020  495f 5069 6e4c 656e 6774 685f 5f39 5069 6e4c 656e 6774 6846 7620 6765 745f 495f 5069 6e4c 656e 6774 685f 5f39 5069 6e4c
3452100  656e 6774 6846 6920 3b3b 3b00 436f 6447 656e 3a54 2830 2c39 3229 3d73 3234 4269 7457 6964 7468 5f5f 364d 6f64 4765 6e3a
3452160  2830 2c31 292c 302c 3332 3b45 5374 6174 655f 5f36 4d6f 6447 656e 3a28 302c 3738 292c 3332 2c33 323b 5069 6e4e 616d 654c
3452240  656e 6774 685f 5f36 4d6f 6447 656e 3a28 302c 3838 292c 3634 2c39 363b 5f5f 7670 7472 5f5f 364d 6f64 4765 6e3a 2830 2c33
3452320  3329 2c31 3630 2c33 323b 3b00 4d6f 6447 656e 3a5a 634d 6f64 4765 6e3b 3b5f 5f63 745f 5f36 4d6f 6447 656e 4676 205f 5f63
3452400  745f 5f36 4d6f 6447 656e 4652 4336 4d6f 6447 656e 2073 6574 5f42 6974 5769 6474 685f 5f36 4d6f 6447 656e 4669 2073 6574
3452460  5f45 5374 6174 655f 5f36 4d6f 6447 656e 4637 426f 6f6c 6561 6e20 6765 745f 4553 7461 7465 5f5f 364d 6f64 4765 6e46 7620
3452540  7365 745f 5069 6e4c 656e 6774 685f 5f36 4d6f 6447 656e 4650 6354 3120 6765 745f 5069 6e4c 656e 6774 685f 5f36 4d6f 6447
3452620  656e 4650 6320 7365 7449 6e64 6578 5f5f 364d 6f64 4765 6e46 7620 5c00 7365 744e 616d 6549 6e64 6578 5f5f 364d 6f64 4765
3452700  6e46 5063 204c 6f61 645f 5648 444c 5f44 6174 615f 5f36 4d6f 6447 656e 4650 374e 4f62 6a65 6374 2043 6f6d 706f 7365 5f4d
3452760  6f64 4765 6e5f 4465 7363 7269 7074 6f72 5f5f 364d 6f64 4765 6e46 5063 2065 7870 6c61 696e 5f5f 364d 6f64 4765 6e46 7620
3453040  5f5f 6474 5f5f 364d 6f64 4765 6e46 7620 3b3b 3b00 5f5f 7074 626c 5f5f 364d 6f64 4765 6e5f 5f41 6464 6572 5f63 7878 3a47
3453120  2830 2c33 3329 0049 4f5f 4d61 6e61 6765 723a 5428 302c 3933 293d 7333 3669 6670 5f5f 3130 494f 5f4d 616e 6167 6572 3a28
3453200  302c 3638 292c 302c 3332 3b6f 6670 5f5f 3130 494f 5f4d 616e 6167 6572 3a28 302c 3638 292c 3332 2c33 323b 6d66 705f 5f31
3453260  3049 4f5f 4d61 6e61 6765 723a 2830 2c36 3829 2c36 342c 3332 3b63 6670 5f5f 3130 494f 5f4d 616e 6167 6572 3a28 302c 3638
3453340  292c 3936 2c33 323b 4946 696c 654e 616d 655f 5f31 3049 4f5f 4d61 6e61 6765 723a 2830 2c32 3029 2c31 3238 2c33 323b 4f46
```

| | | | | | | | | | | | | | | | | | | | | | | | | |
|---|---|---|---|---|---|---|---|---|---|---|---|---|---|---|---|---|---|---|---|---|---|---|---|---|
| 3453420 | 696c | 654e | 616d | 655f | 5f31 | 3049 | 4f5f | 4d61 | 6e61 | 6765 | 723a | 2830 | 2c32 | 3029 | 2c31 | 3630 | 2c33 | 323b | 4346 | 696c | 654e | 616d | 655f | 5f31 |
| 3453500 | 3049 | 4f5f | 4d61 | 6e61 | 6765 | 723a | 2830 | 2c32 | 3029 | 2c31 | 3932 | 2c33 | 323b | 4346 | 696c | 654e | 616d | 655f | 5f31 | 3049 | 4f5f | 4d61 | 6e61 | 6765 |
| 3453560 | 723a | 2830 | 2c32 | 3029 | 2c32 | 3234 | 2c33 | 323b | 6375 | 4c69 | 6e65 | 5f5f | 3130 | 494f | 5f4d | 616e | 6167 | 6572 | 3a28 | 302c | 3129 | 2c32 | 3536 | 2c33 |
| 3453640 | 323b | 3b00 | 494f | 5f4d | 616e | 6167 | 6572 | 3a5a | 6349 | 4f5f | 4161 | 6e61 | 6765 | 723b | 3b5f | 5f63 | 745f | 5f31 | 3049 | 4f5f | 4d61 | 6e61 | 6765 | 7246 |
| 3453720 | 5063 | 205f | 5f64 | 745f | 5f31 | 3049 | 4f5f | 4d61 | 6e61 | 6765 | 7246 | 7620 | 494f | 4368 | 6563 | 6b5f | 5f31 | 3049 | 4f5f | 4161 | 6e61 | 6765 | 7246 | 7620 |
| 3454000 | 436f | 7079 | 4669 | 6c65 | 546f | 4c69 | 6e65 | 5f5f | 3130 | 494f | 5f4d | 616e | 6167 | 6572 | 4669 | 2043 | 6f70 | 7946 | 696c | 6554 | 6f45 | 6e64 | 5f5f | 3130 |
| 3454060 | 494f | 5f4d | 616e | 6167 | 6572 | 4676 | 2053 | 7461 | 746d | 656e | 7448 | 616e | 6465 | 6c65 | 725f | 5f31 | 3049 | 4f5f | 4d61 | 6e61 | 6765 | 7246 | 5063 | 5431 |
| 3454140 | 6920 | 5c00 | 436f | 7079 | 4669 | 6c65 | 546f | 4b65 | 7957 | 5f5f | 3130 | 494f | 5f4d | 616e | 6167 | 6572 | 4650 | 6354 | 3120 | 4561 | 745f | 5374 | 6174 | 656d |
| 3454220 | 656e | 745f | 5f31 | 3049 | 4f5f | 4d61 | 6e61 | 6765 | 7246 | 5063 | 5431 | 2057 | 5f4f | 7574 | 4669 | 6c65 | 5f5f | 3130 | 494f | 5f4d | 616e | 6167 | 6572 | 4650 |
| 3454300 | 6320 | 575f | 4d46 | 696c | 655f | 5f31 | 3049 | 4f5f | 4d61 | 6e61 | 6765 | 7246 | 5063 | 2057 | 5f43 | 4669 | 6c65 | 5f5f | 3130 | 494f | 5f4d | 616e | 6167 | 6572 |
| 3454360 | 4650 | 6320 | 3b3b | 3b00 | 5f5f | 4335 | 353a | 5428 | 302c | 3934 | 293d | 7534 | 7376 | 616c | 7565 | 3a28 | 302c | 3230 | 292c | 302c | 3332 | 3b69 | 7661 | 6c75 |
| 3454440 | 653a | 2830 | 2c31 | 292c | 302c | 3332 | 3b66 | 7661 | 6c75 | 653a | 2830 | 2c39 | 292c | 302c | 3332 | 3b3b | 005f | 5f43 | 3535 | 3a5a | 635f | 5f43 | 3535 | 3b3b |
| 3454520 | 3b3b | 3b00 | 4765 | 6e56 | 616c | 7565 | 3a54 | 2830 | 2c39 | 3529 | 3d73 | 3136 | 5f5f | 7670 | 7472 | 5f5f | 364f | 626a | 6563 | 743a | 2830 | 2c33 | 3329 | 2c30 |
| 3454600 | 2c33 | 323b | 6e61 | 6165 | 5f5f | 374e | 4f62 | 6a65 | 6374 | 3a28 | 302c | 3230 | 292c | 3332 | 2c33 | 323b | 7479 | 7065 | 5f5f | 3847 | 656e | 5661 | 6c75 | 653a |
| 3454660 | 2830 | 2c37 | 3229 | 2c36 | 342c | 3332 | 3b5f | 5f4f | 3535 | 5f5f | 3847 | 656e | 5661 | 6c75 | 653a | 2830 | 2c39 | 3429 | 2c39 | 362c | 3332 | 3b3b | 0047 | 656e |
| 3454740 | 5661 | 6c75 | 653a | 5163 | 4765 | 6e56 | 616c | 7565 | 3b4e | 4f62 | 6a65 | 6374 | 3b5f | 5f63 | 745f | 5f38 | 4765 | 6e56 | 616c | 7565 | 4676 | 205f | 5f63 | 745f |
| 3455020 | 5f38 | 4765 | 6e56 | 616c | 7565 | 4652 | 4338 | 4765 | 6e56 | 616c | 7565 | 205f | 5f64 | 745f | 5f38 | 4765 | 6e56 | 616c | 7565 | 4676 | 2073 | 6574 | 5f47 | 656e |
| 3455100 | 5661 | 6c75 | 655f | 7479 | 7065 | 5f5f | 3847 | 656e | 5661 | 6c75 | 6546 | 5063 | 6920 | 7365 | 745f | 4765 | 6e56 | 616c | 7565 | 4676 | 2073 | 6574 | 5f47 | 656e |
| 3455160 | 6e56 | 616c | 7565 | 4631 | 3056 | 616c | 7565 | 5f54 | 7970 | 6520 | 7365 | 745f | 4765 | 6e56 | 616c | 7565 | 5f74 | 7970 | 655f | 5f38 | 4765 | | | |
| 3455240 | 0073 | 6574 | 5f47 | 656e | 5661 | 6c75 | 655f | 5f38 | 4765 | 6e56 | 616c | 7565 | 4669 | 2073 | 6574 | 5f47 | 656e | 5661 | 6c75 | 655f | 5f38 | 4765 | 6e56 | 616c |
| 3455320 | 7565 | 4666 | 2067 | 6574 | 5f47 | 656e | 5661 | 6c75 | 655f | 7479 | 7065 | 5f5f | 3847 | 656e | 5661 | 6c75 | 6546 | 7620 | 6765 | 745f | 4765 | 6e56 | 616c | 7565 |
| 3455400 | 5f73 | 5f5f | 3847 | 656e | 5661 | 6c75 | 6546 | 7620 | 6765 | 745f | 4765 | 6e56 | 616c | 7565 | 5f69 | 5f5f | 3847 | 656e | 5661 | 6c75 | 6546 | 7620 | 6765 | 745f |
| 3455460 | 4765 | 6e56 | 616c | 7565 | 5f66 | 5f5f | 3847 | 656e | 5661 | 6c75 | 6546 | 7620 | 6578 | 706c | 6169 | 6e5f | 5f38 | 4765 | 6e56 | 616c | 7565 | 4650 | 6320 | 5c00 |
| 3455540 | 6368 | 6563 | 6b5f | 5f38 | 4765 | 6e56 | 616c | 7565 | 4669 | 203b | 3b3b | 005f | 5f70 | 7462 | 6c5f | 5f38 | 4765 | 6e56 | 616c | 7565 | 5f5f | 4164 | 6465 | 725f |
| 3455620 | 6378 | 783a | 4728 | 302c | 3333 | 2900 | 7061 | 7261 | 6d65 | 7465 | 723a | 5428 | 302c | 3936 | 293d | 7336 | 305f | 5f76 | 7074 | 725f | 5f36 | 4f62 | 6a65 | 6374 |
| 3455700 | 3a28 | 302c | 3333 | 292c | 302c | 3332 | 3b6e | 616d | 655f | 5f37 | 4e4f | 626a | 6563 | 743a | 2830 | 2c32 | 3029 | 2c33 | 322c | 3332 | 3b6e | 616d | 655f | 5f39 |
| 3455760 | 7061 | 7261 | 6d65 | 7465 | 723a | 2830 | 2c32 | 3029 | 2c36 | 342c | 3332 | 3b74 | 7970 | 655f | 5f39 | 7061 | 7261 | 6d65 | 7465 | 723a | 2830 | 2c32 | 3029 | 2c39 |
| 3456040 | 362c | 3332 | 3b72 | 616e | 6765 | 5f5f | 3970 | 6172 | 616d | 6574 | 6572 | 3a28 | 302c | 3230 | 292c | 3132 | 382c | 3332 | 3b73 | 6c69 | 6365 | 5f5f | 3970 | 6172 |
| 3456120 | 616d | 6574 | 6572 | 3a28 | 302c | 3230 | 292c | 3136 | 302c | 3332 | 3b53 | 6c6f | 775f | 5f39 | 7061 | 7261 | 6d65 | 7465 | 723a | 2830 | 2c31 | 292c | 3139 | 322c |
| 3456200 | 3332 | 3b53 | 6869 | 6768 | 5f5f | 3970 | 6172 | 616d | 6574 | 6572 | 3a28 | 302c | 3129 | 2c32 | 3234 | 2c33 | 323b | 5c00 | 5043 | 6c61 | 7373 | 5f5f | 3970 | 6172 |
| 3456260 | 616d | 6574 | 6572 | 3a28 | 302c | 3736 | 292c | 3235 | 362c | 3332 | 3b50 | 5852 | 6566 | 5f5f | 3970 | 6172 | 616d | 6574 | 6572 | 3a28 | 302c | 3937 | 293d | 2a28 |
| 3456340 | 302c | 3936 | 292c | 3238 | 382c | 3332 | 3b6d | 6f64 | 655f | 5f39 | 7061 | 7261 | 6d65 | 7465 | 723a | 2830 | 2c37 | 3529 | 2c33 | 3230 | 2c33 | 323b | 7661 | 6c75 |
| 3456420 | 655f | 5f39 | 7061 | 7261 | 6d65 | 7465 | 723a | 2830 | 2c39 | 3529 | 2c33 | 3532 | 2c31 | 3238 | 3b3b | 0070 | 6172 | 616d | 6574 | 6572 | 3a5a | 6170 | 6172 | 616d |
| 3456500 | 6574 | 6572 | 3b4e | 4f62 | 6a65 | 6374 | 3b5f | 5f63 | 745f | 5f39 | 7061 | 7261 | 6d65 | 7465 | 7246 | 7620 | 5f5f | 6374 | 5f5f | 3970 | 6172 | 616d | 6574 | 6572 |
| 3456560 | 4652 | 4339 | 7061 | 7261 | 6d65 | 7465 | 7220 | 5f5f | 6474 | 5f5f | 3970 | 6172 | 616d | 6574 | 6572 | 4676 | 2067 | 6574 | 5f70 | 6172 | 616d | 6574 | 6572 | 5f6d |
| 3456640 | 6f64 | 655f | 5f39 | 7061 | 7261 | 6d65 | 7465 | 7246 | 7620 | 6765 | 745f | 7061 | 7261 | 6d65 | 7465 | 725f | 636c | 6173 | 735f | 5f39 | 7061 | 7261 | 6d65 | 7465 |
| 3456720 | 7246 | 7620 | 6765 | 745f | 7061 | 7261 | 5f73 | 6c6f | 775f | 5f39 | 7061 | 7261 | 6d65 | 7465 | 7246 | 7620 | 5c00 | 6765 | 745f | 7061 | 7261 | 5f73 | 6869 | 6768 |
| 3457000 | 5f5f | 3970 | 6172 | 616d | 6574 | 6572 | 4676 | 2067 | 6574 | 5f70 | 6172 | 616d | 6574 | 6572 | 5f72 | 616e | 6765 | 5f5f | 3970 | 6172 | 616d | 6574 | 6572 | 4676 |
| 3457060 | 2067 | 6574 | 5f70 | 6172 | 616d | 6574 | 6572 | 5f74 | 7970 | 655f | 5f39 | 7061 | 7261 | 6d65 | 7465 | 7246 | 7620 | 6765 | 745f | 7061 | 7261 | 6d65 | 7465 | 725f |
| 3457140 | 6e61 | 6d65 | 5f5f | 3970 | 6172 | 616d | 6574 | 6572 | 4676 | 2067 | 6574 | 5f70 | 6172 | 616d | 6574 | 6572 | 5f73 | 6c69 | 6365 | 5f5f | 3970 | 6172 | 616d | 6574 |
| 3457220 | 6572 | 4676 | 2067 | 6574 | 5f70 | 6172 | 616d | 6574 | 6572 | 5f50 | 5852 | 4546 | 5f5f | 3970 | 6172 | 616d | 6574 | 6572 | 4631 | 3050 | 6172 | 615f | 436c | 6173 |
| 3457300 | 7320 | 5c00 | 6765 | 745f | 636f | 7272 | 6563 | 745f | 6c65 | 6e67 | 7468 | 5f5f | 3970 | 6172 | 616d | 6574 | 6572 | 4676 | 2067 | 6574 | 5f70 | 6172 | 615f | 6c65 |
| 3457360 | 6e67 | 7468 | 5f5f | 3970 | 6172 | 616d | 6574 | 6572 | 4676 | 2067 | 6574 | 5f70 | 6172 | 615f | 7374 | 6174 | 7573 | 5f5f | 3970 | 6172 | 616d | 6574 | 6572 | 4676 |
| 3457440 | 2067 | 6574 | 5f70 | 6172 | 616d | 6574 | 6572 | 5f76 | 616c | 7565 | 5f5f | 3970 | 6172 | 616d | 6574 | 6572 | 4676 | 2067 | 6574 | 5f70 | 6172 | 616d | 6574 | 6572 |
| 3457520 | 5f76 | 616c | 7565 | 5f74 | 7970 | 655f | 5f39 | 7061 | 7261 | 6d65 | 7465 | 7246 | 7620 | 6765 | 745f | 7061 | 7261 | 6d65 | 7465 | 725f | 7376 | 616c | 7565 | 5f5f |
| 3457600 | 3970 | 6172 | 616d | 6574 | 6572 | 4676 | 205c | 0067 | 6574 | 5f70 | 6172 | 616d | 6574 | 6572 | 5f69 | 7661 | 6c75 | 655f | 5f39 | 7061 | 7261 | 6d65 | 7465 | 7246 |
| 3457660 | 7620 | 6765 | 745f | 7061 | 7261 | 6d65 | 7465 | 725f | 6676 | 616c | 7565 | 5f5f | 3970 | 6172 | 616d | 6574 | 6572 | 4676 | 2073 | 6574 | 5f70 | 6172 | 616d | 6574 |
| 3457740 | 6572 | 5f6e | 616d | 655f | 5f39 | 7061 | 7261 | 6d65 | 7465 | 7246 | 5063 | 2073 | 6574 | 5f70 | 6172 | 616d | 6574 | 6572 | 5f63 | 6c61 | 7373 | 5f5f | 3970 | 6172 |
| 3460020 | 616d | 6574 | 6572 | 4631 | 3050 | 6172 | 615f | 436c | 6173 | 7320 | 7365 | 745f | 7061 | 7261 | 6d65 | 7465 | 725f | 7479 | 7065 | 5f5f | 3970 | 6172 | 616d | 6574 |
| 3460100 | 6572 | 4650 | 6320 | 7365 | 745f | 7061 | 7261 | 6d65 | 7465 | 725f | 736c | 6963 | 655f | 5f39 | 7061 | 7261 | 6d65 | 7465 | 7246 | 5063 | 205c | 0073 | 6574 | 5f70 |
| 3460160 | 6172 | 616d | 6574 | 6572 | 5f73 | 7261 | 6e67 | 655f | 5f39 | 7061 | 7261 | 6d65 | 7465 | 7246 | 5063 | 2073 | 6574 | 5f70 | 6172 | 616d | 6574 | 6572 | 5f50 | 5852 |
| 3460240 | 6566 | 5f5f | 3970 | 6172 | 616d | 6574 | 6572 | 4650 | 6350 | 3562 | 6c6f | 636b | 2073 | 6574 | 5f70 | 6172 | 616d | 6574 | 6572 | 5f72 | 616e | 6765 | 5f5f | 3970 |
| 3460320 | 6172 | 616d | 6574 | 6572 | 4650 | 6320 | 7365 | 745f | 7061 | 7261 | 6d65 | 7465 | 725f | 6d6f | 6465 | 5f5f | 3970 | 6172 | 616d | 6574 | 6572 | 4650 | 6320 | 7365 |
| 3460400 | 745f | 7061 | 7261 | 6d65 | 7465 | 725f | 7661 | 6c75 | 655f | 5f39 | 7061 | 7261 | 6d65 | 7465 | 7246 | 5063 | 2073 | 6574 | 5f70 | 6172 | 616d | 6574 | 6572 | 5f76 |
| 3460460 | 616c | 7565 | 5f5f | 3970 | 6172 | 616d | 6574 | 6572 | 4669 | 205c | 0073 | 6574 | 5f70 | 6172 | 616d | 6574 | 6572 | 5f76 | 616c | 7565 | 5f5f | 3970 | 6172 | 616d |

| | | | | | | | | | | | | | | | | | | | | | | | | |
|---|---|---|---|---|---|---|---|---|---|---|---|---|---|---|---|---|---|---|---|---|---|---|---|---|
| 3460540 | 6574 | 6572 | 4666 | 2073 | 6574 | 5f70 | 6172 | 616d | 6574 | 6572 | 5f76 | 616c | 7565 | 5f74 | 7970 | 655f | 5f39 | 7061 | 7261 | 6d65 | 7465 | 7246 | 5063 | 2067 |
| 3460620 | 6574 | 5f56 | 4844 | 4c5f | 466f | 726d | 616c | 5f50 | 6172 | 616d | 5f5f | 3970 | 6172 | 616d | 6574 | 6572 | 4650 | 6369 | 2067 | 6574 | 5f56 | 4844 | 4c5f | 5072 |
| 3460700 | 6d74 | 725f | 5f39 | 7061 | 7261 | 6d65 | 7465 | 7246 | 5063 | 6920 | 6765 | 745f | 5648 | 444c | 5f45 | 7870 | 616e | 6465 | 645f | 466f | 726d | 616c | 5f50 | 6172 |
| 3460760 | 616d | 5f5f | 3970 | 6172 | 616d | 6574 | 6572 | 4650 | 3562 | 6c6f | 636b | 5063 | 6720 | 5c00 | 6765 | 745f | 5648 | 444c | 5f45 | 7870 | 616e | 6465 | 645f | 5072 |
| 3461040 | 6d74 | 725f | 4d61 | 705f | 5f39 | 7061 | 7261 | 6d65 | 7465 | 7246 | 5035 | 626c | 6f63 | 6b50 | 6369 | 2065 | 7870 | 6c61 | 696e | 5f5f | 3970 | 6172 | 616d | 6574 |
| 3461120 | 6572 | 4650 | 6320 | 3b3b | 3b00 | 5f5f | 7074 | 626c | 5f5f | 3970 | 6172 | 616d | 6574 | 6572 | 5f5f | 4164 | 6465 | 725f | 6378 | 783a | 4728 | 302c | 3333 | 2900 |
| 3461200 | 626c | 6f63 | 6b5f | 6174 | 7472 | 6962 | 7574 | 6573 | 3a54 | 2830 | 2c39 | 3829 | 3d73 | 3238 | 5f5f | 7670 | 7472 | 5f5f | 364f | 626a | 6563 | 743a | 2830 | 2c33 |
| 3461260 | 3329 | 2c30 | 2c33 | 323b | 6e61 | 6d65 | 5f5f | 374e | 4f62 | 6a65 | 6374 | 3a28 | 302c | 3230 | 292c | 3332 | 2c33 | 323b | 6e61 | 6d65 | 5f5f | 3136 | 626c | 6f63 |
| 3461340 | 6b5f | 6174 | 7472 | 6962 | 7574 | 6573 | 3a28 | 302c | 3230 | 292c | 3634 | 2c33 | 323b | 7661 | 6c75 | 655f | 5f31 | 3662 | 6c6f | 636b | 5f61 | 7474 | 7269 | 6275 |
| 3461420 | 7465 | 733a | 2830 | 2c39 | 3529 | 2c39 | 362c | 3132 | 383b | 3b00 | 626c | 6f63 | 6b5f | 6174 | 7472 | 6962 | 7574 | 6573 | 3a5a | 6362 | 6c6f | 636b | 5f61 | 7474 |
| 3461500 | 7269 | 6275 | 7465 | 733b | 4e4f | 626a | 6563 | 743b | 5f5f | 6374 | 5f5f | 3136 | 626c | 6f63 | 6b5f | 6174 | 7472 | 6962 | 7574 | 6573 | 4650 | 6320 | 5f5f | 6374 |
| 3461560 | 5f5f | 3136 | 626c | 6f63 | 6b5f | 6174 | 7472 | 6962 | 7574 | 6573 | 4676 | 205f | 5f63 | 745f | 5f31 | 3662 | 6c6f | 636b | 5f61 | 7474 | 7269 | 6275 | 7465 | 7346 |
| 3461640 | 5243 | 3136 | 626c | 6f63 | 6b5f | 6174 | 7472 | 6962 | 7574 | 6573 | 205f | 5f64 | 745f | 5f31 | 3662 | 6c6f | 636b | 5f61 | 7474 | 7269 | 6275 | 7465 | 7346 | 7620 |
| 3461720 | 7365 | 745f | 6174 | 7472 | 6962 | 7574 | 655f | 6e61 | 6d65 | 5f5f | 3136 | 626c | 6f63 | 6b5f | 6174 | 7472 | 6962 | 7574 | 6573 | 4650 | 6320 | 5c00 | 7365 | 745f |
| 3462000 | 6174 | 7472 | 6962 | 7574 | 655f | 7661 | 6c75 | 655f | 5f31 | 3662 | 6c6f | 636b | 5f61 | 7474 | 7269 | 6275 | 7465 | 7346 | 5063 | 2073 | 6574 | 5f61 | 7474 | 7269 |
| 3462060 | 6275 | 7465 | 5f76 | 616c | 7565 | 5f5f | 3136 | 626c | 6f63 | 6b5f | 6174 | 7472 | 6962 | 7574 | 6573 | 4669 | 2073 | 6574 | 5f61 | 7474 | 7269 | 6275 | 7465 | 5f76 |
| 3462140 | 616c | 7565 | 5f5f | 3136 | 626c | 6f63 | 6b5f | 6174 | 7472 | 6962 | 7574 | 6573 | 4666 | 2073 | 6574 | 5f61 | 7474 | 7269 | 6275 | 7465 | 5f74 | 7970 | 655f | 5f31 |
| 3462220 | 3662 | 6c6f | 636b | 5f61 | 7474 | 7269 | 6275 | 7465 | 7346 | 5063 | 2067 | 6574 | 5f61 | 7474 | 7269 | 6275 | 7465 | 5f6e | 616d | 655f | 5f31 | 3662 | 6c6f | 636b |
| 3462300 | 5f61 | 7474 | 7269 | 6275 | 7465 | 7346 | 7620 | 5c00 | 6765 | 745f | 6174 | 7472 | 6962 | 7574 | 655f | 7479 | 7065 | 5f5f | 3136 | 626c | 6f63 | 6b5f | 6174 | 7472 |
| 3462360 | 6962 | 7574 | 6573 | 4676 | 2067 | 6574 | 5f61 | 7474 | 7269 | 6275 | 7465 | 5f73 | 7661 | 6c75 | 655f | 5f31 | 3662 | 6c6f | 636b | 5f61 | 7474 | 7269 | 6275 | 7465 |
| 3462440 | 7346 | 7620 | 6765 | 745f | 6174 | 7472 | 6962 | 7574 | 655f | 6976 | 616c | 7565 | 5f5f | 3136 | 626c | 6f63 | 6b5f | 6174 | 7472 | 6962 | 7574 | 6573 | 4676 | 2067 |
| 3462520 | 6574 | 5f61 | 7474 | 7269 | 6275 | 7465 | 5f66 | 7661 | 6c75 | 655f | 5f31 | 3662 | 6c6f | 636b | 5f61 | 7474 | 7269 | 6275 | 7465 | 7346 | 7620 | 6765 | 745f | 6174 |
| 3462600 | 7472 | 6962 | 7574 | 655f | 7661 | 6c75 | 655f | 5f31 | 3662 | 6c6f | 636b | 5f61 | 7474 | 7269 | 6275 | 7465 | 7346 | 7620 | 5c00 | 6578 | 706c | 6169 | 6e5f | 5f31 |
| 3462660 | 3662 | 6c6f | 636b | 5f61 | 7474 | 7269 | 6275 | 7465 | 7346 | 5063 | 203b | 3b3b | 005f | 5f70 | 7462 | 6c5f | 5f31 | 3662 | 6c6f | 636b | 5f61 | 7474 | 7269 | 6275 |
| 3462740 | 7465 | 735f | 5f41 | 6464 | 6572 | 5f63 | 7878 | 3a47 | 2830 | 2c33 | 3329 | 0065 | 6e74 | 6974 | 793a | 5428 | 302c | 3939 | 293d | 7336 | 305f | 5f76 | 7074 | 725f |
| 3463020 | 5f36 | 4f62 | 6a65 | 6374 | 3a28 | 302c | 3333 | 292c | 302c | 3332 | 3b6e | 616d | 655f | 5f37 | 4e4f | 626a | 6563 | 743a | 2830 | 2c32 | 3029 | 2c33 | 322c | 3332 |
| 3463100 | 3b6e | 616d | 655f | 5f36 | 656e | 7469 | 7479 | 3a28 | 302c | 3230 | 292c | 3634 | 2c33 | 323b | 4669 | 6c65 | 4e61 | 6d65 | 5f5f | 3665 | 6e74 | 6974 | 793a | 2830 |
| 3463160 | 2c32 | 3029 | 2c39 | 362c | 3332 | 3b61 | 7263 | 686e | 616d | 655f | 5f36 | 656e | 7469 | 7479 | 3a28 | 302c | 3230 | 292c | 3132 | 382c | 3332 | 3b74 | 7970 | 655f |
| 3463240 | 5f36 | 656e | 7469 | 7479 | 3a28 | 302c | 3129 | 2c31 | 3b30 | 2c33 | 323b | 6172 | 6368 | 5f6c | 696e | 655f | 5f36 | 656e | 7469 | 7479 | 3a28 | 302c | 3129 | 2c31 |
| 3463320 | 3932 | 2c33 | 323b | 6361 | 6c6c | 5f6c | 696e | 655f | 5f36 | 656e | 7469 | 7479 | 3a28 | 302c | 3129 | 2c32 | 3234 | 2c33 | 323b | 5c00 | 7072 | 6373 | 5f6c | 696e |
| 3463400 | 655f | 5f36 | 656e | 7469 | 7479 | 3a28 | 302c | 3129 | 2c32 | 3536 | 2c33 | 323b | 7175 | 616c | 6966 | 6965 | 645f | 5f36 | 656e | 7469 | 7479 | 3a28 | 302c | 3838 |
| 3463460 | 292c | 3238 | 382c | 3936 | 3b73 | 7562 | 5f62 | 6c6f | 636b | 735f | 5f36 | 656e | 7469 | 7479 | 3a28 | 302c | 3838 | 292c | 3338 | 342c | 3936 | 3b3b | 0065 | 6e74 |
| 3463540 | 6974 | 793a | 5a63 | 656e | 7469 | 7479 | 3b4e | 4f62 | 6a65 | 6374 | 3b5f | 5f63 | 745f | 5f36 | 656e | 7469 | 7479 | 4676 | 205f | 5f63 | 745f | 5f36 | 656e | 7469 |
| 3463620 | 7479 | 4652 | 4336 | 656e | 7469 | 7479 | 205f | 5f64 | 745f | 5f36 | 656e | 7469 | 7479 | 4675 | 2073 | 6574 | 5f65 | 6e74 | 6974 | 795f | 6e61 | 6d65 | 5f5f | 3665 |
| 3463700 | 6e74 | 6974 | 7946 | 5063 | 2073 | 6574 | 5f65 | 6e74 | 6974 | 795f | 6669 | 6c65 | 5f5f | 3665 | 6e74 | 6974 | 7946 | 5063 | 2073 | 6574 | 5f65 | 6e74 | 6974 | 795f |
| 3463760 | 6172 | 6368 | 6e61 | 6165 | 5f5f | 3665 | 6e74 | 6974 | 7946 | 5063 | 2073 | 6574 | 5f65 | 6e74 | 6974 | 795f | 7479 | 7065 | 5f5f | 3665 | 6e74 | 6974 | 7946 | 5063 |
| 3464040 | 205c | 0073 | 6574 | 5f61 | 7263 | 685f | 6c69 | 6e65 | 5f5f | 3665 | 6e74 | 6974 | 7946 | 6920 | 7365 | 745f | 6361 | 6c6c | 5f6c | 696e | 655f | 5f36 | 656e | 7469 |
| 3464120 | 7479 | 4669 | 2073 | 6574 | 5f70 | 7263 | 735f | 6c69 | 6e65 | 5f5f | 3665 | 6e74 | 6974 | 7946 | 6920 | 6765 | 745f | 656e | 7469 | 7479 | 5f6e | 616d | 655f | 5f36 |
| 3464200 | 656e | 7469 | 7479 | 4676 | 2067 | 6574 | 5f65 | 6e74 | 6974 | 795f | 6172 | 6368 | 6e61 | 6d65 | 5f5f | 3665 | 6e74 | 6974 | 7946 | 7620 | 6765 | 745f | 656e | 7469 |
| 3464260 | 7479 | 5f66 | 696c | 655f | 5f36 | 656e | 7469 | 7479 | 4676 | 2067 | 6574 | 5f65 | 6e74 | 6974 | 795f | 7479 | 7065 | 5f5f | 3665 | 6e74 | 6974 | 7946 | 7620 | 5c00 |
| 3464340 | 6765 | 745f | 6172 | 6368 | 5f6c | 696e | 655f | 5f36 | 656e | 7469 | 7479 | 4676 | 2067 | 6574 | 5f63 | 616c | 6c5f | 6c69 | 6e65 | 5f5f | 3665 | 6e74 | 6974 | 7946 |
| 3464420 | 7620 | 6765 | 745f | 7072 | 6373 | 5f6c | 696e | 655f | 5f36 | 656e | 7469 | 7479 | 4676 | 2069 | 7347 | 5445 | 5f5f | 3665 | 6e74 | 6974 | 7946 | 5036 | 4f62 | 6a65 |
| 3464500 | 6374 | 2069 | 734c | 5445 | 5f5f | 3665 | 6e74 | 6974 | 7946 | 5036 | 4f62 | 6a65 | 6374 | 2065 | 7870 | 6c61 | 696e | 5f5f | 3665 | 6e74 | 6974 | 7946 | 5063 | 203b |
| 3464560 | 3b3b | 005f | 5f70 | 7462 | 6c5f | 5f35 | 656e | 7469 | 7479 | 5f5f | 4164 | 6465 | 725f | 6378 | 783a | 4728 | 302c | 3333 | 2900 | 626c | 6f63 | 6b3a | 5428 | 302c |
| 3464640 | 3130 | 3029 | 3d73 | 3134 | 305f | 5f76 | 7074 | 725f | 5f36 | 4f62 | 6a65 | 6374 | 3a28 | 302c | 3333 | 292c | 302c | 3332 | 3b6e | 616d | 655f | 5f37 | 4e4f | 626a |
| 3464720 | 6563 | 743a | 2830 | 2c32 | 3029 | 2c33 | 322c | 3332 | 3b6e | 616d | 655f | 5f35 | 626c | 6f63 | 6b3a | 2830 | 2c32 | 3029 | 2c36 | 342c | 3332 | 3b74 | 7970 | 655f |
| 3465000 | 5f35 | 626c | 6f63 | 6b3a | 2830 | 2c31 | 292c | 3936 | 2c33 | 323b | 4d47 | 5f4e | 616d | 655f | 5f35 | 626c | 6f63 | 6b3a | 2830 | 2c32 | 3029 | 2c31 | 3238 | 2c33 |
| 3465060 | 323b | 4d47 | 5f54 | 7970 | 655f | 5f35 | 626c | 6f63 | 6b3a | 2830 | 2c32 | 3029 | 2c31 | 3630 | 2c33 | 323b | 4d47 | 5f53 | 7562 | 5479 | 7065 | 5f5f | 3562 | 6c6f |
| 3465140 | 636b | 3a28 | 302c | 3230 | 292c | 3139 | 322c | 3332 | 3b50 | 6172 | 656e | 745f | 5f35 | 626c | 6f63 | 6b3a | 2830 | 2c39 | 3929 | 2c32 | 3234 | 2c34 | 3830 | 3b5c |
| 3465220 | 004d | 4744 | 7363 | 7270 | 746e | 5f5f | 3562 | 6c6f | 636b | 3a28 | 302c | 3130 | 3129 | 3d2a | 2830 | 2c39 | 3229 | 2c37 | 3034 | 2c33 | 323b | 4163 | 7475 | 616c |
| 3465300 | 5f5f | 3562 | 6c6f | 636b | 3a28 | 302c | 3838 | 292c | 3733 | 352c | 3936 | 3b46 | 6f72 | 6d61 | 6c5f | 5f35 | 626c | 6f63 | 6b3a | 2830 | 2c38 | 3829 | 2c38 | 3332 |
| 3465360 | 2c39 | 363b | 5265 | 736f | 6c76 | 6564 | 5f5f | 3562 | 6c6f | 636b | 3a28 | 302c | 3838 | 292c | 3932 | 382c | 3936 | 3b41 | 7474 | 7269 | 6275 | 7465 | 735f | 5f35 |
| 3465440 | 626c | 6f63 | 6b3a | 2830 | 2c38 | 3829 | 2c31 | 3032 | 342c | 3936 | 3b3b | 0062 | 6c6f | 636b | 3a5a | 6362 | 6c6f | 636b | 3b4e | 4f62 | 6a65 | 6374 | 3b5f | 5f63 |
| 3465520 | 745f | 5f35 | 626c | 6f63 | 6b46 | 7620 | 5f5f | 6374 | 5f5f | 3562 | 6c6f | 636b | 4652 | 4335 | 626c | 6f63 | 6b20 | 5f5f | 6474 | 5f5f | 3562 | 6c6f | 636b | 4676 |
| 3465600 | 2073 | 6574 | 5f62 | 6c6f | 636b | 5f6e | 616d | 655f | 5f35 | 626c | 6f63 | 6b46 | 5063 | 2073 | 6574 | 5f62 | 6c6f | 636b | 5f74 | 7970 | 655f | 5f35 | 626c | 6f63 |

```
3465660 6b46 5063 2067 6574 5f62 6c6f 636b 5f6e 616d 655f 5f35 626c 6f63 6b46 7620 6765 745f 626c 6f63 6b5f 7479 7065 5f5f 3562
3465740 6c6f 636b 4676 2067 6574 5f62 6c6f 636b 5f70 6172 656e 745f 5f35 626c 6f63 6b46 7620 5c00 6765 745f 626c 6f63 6b5f 4d6f
3466020 6447 656e 5f5f 3562 6c6f 636b 4676 2067 6574 5f46 6f72 6d61 6c5f 5f35 626c 6f63 6b46 7620 6765 745f 4163 7475 616c 5f5f
3466100 3562 6c6f 636b 4676 2067 6574 5f52 6573 6f6c 7665 645f 5f35 626c 6f63 6b46 7620 6765 745f 4174 7472 6962 7574 655f 5f35
3466160 626c 6f63 6b46 7620 6765 745f 636f 6d70 5f6c 656e 6774 685f 5f35 626c 6f63 6b46 7620 6973 5175 616c 6966 6965 645f 5f35
3466240 626c 6f63 6b46 7620 6973 4c54 455f 5f35 626c 6f63 6b46 5036 4f62 6a65 6374 205c 0069 7347 5445 5f5f 3562 6c6f 636b 4650
3466320 364f 626a 6563 7420 6578 706c 6169 6e5f 5f35 626c 6f63 6b46 5063 2052 6576 6572 7365 416c 6c4c 6973 7473 5f5f 3562 6c6f
3466400 636b 4676 2043 6865 636b 5061 7261 4c69 7374 735f 5f35 626c 6f63 6b46 7620 4368 6563 6b50 6172 616d 4c69 7374 5f5f 3562
3466460 6c6f 636b 4650 3550 4c69 7374 2057 5f56 4844 4c5f 436f 6d70 496e 7374 5f5f 3562 6c6f 636b 4676 2057 5f56 4844 4c5f 436f
3466540 6d70 4465 635f 5f35 626c 6f63 6b46 7620 6765 745f 5648 444c 5f43 6f6d 704c 6162 6c65 5f5f 3562 6c6f 636b 4650 6320 5c00
3466620 6765 745f 5648 444c 5f43 6f6d 704e 616d 555f 5f35 626c 6f63 6b46 5063 2057 5f4d 475f 436f 6d70 4473 6372 7074 6e5f 5f35
3466700 626c 6f63 6b46 7620 575f 4d47 5f43 6865 636b 436f 6d70 5f5f 3562 6c6f 636b 4676 2057 5f43 4c5f 4172 6368 426f 6479 5f5f
3466760 3562 6c6f 636b 4676 2057 5f43 4c5f 456e 7469 7479 4465 635f 5f35 626c 6f63 6b46 7620 3b3b 3b00 5f5f 7074 626c 5f5f 3562
3467040 6c6f 636b 5f5f 4164 6465 725f 6378 783a 4728 302c 3333 2900 5f5f 6374 5f5f 3665 6e74 6974 7946 763a 6628 302c 3130 3229
3467120 3d2a 2030 2c39 3929 005f 5f30 7468 6973 3a70 2830 2c31 3032 2900 2f69 6f6d 652f 6f73 6173 312f 612f 6162 2f73 7263 2f6e
3467200 6577 6f62 6a65 6374 732f 7072 6f67 2f68 7878 2f65 6e74 6974 792e 6878 7800 5f5f 3074 6869 733a 7228 302c 3130 3229 005f
3467260 5f30 7468 6973 203a 5a74 6c00 5f5f 6374 5f5f 3665 6e74 6974 7946 7620 3a5a 7446 0044 6573 6967 6e55 6e69 743a 5428 302c
3467340 3130 3329 3d73 3532 5f5f 7670 7472 5f5f 364f 626a 6563 743a 2830 2c33 3329 2c30 2c33 323b 6e61 6d65 5f5f 374e 4f62 6a65
3467420 6374 3a28 302c 3230 292c 3332 2c33 323b 4465 556e 4e61 6d65 5f5f 3130 4465 7369 676e 556e 6974 3a28 302c 3230 292c 3634
3467500 2c33 323b 4669 6c65 4e61 6d65 5f5f 3130 4465 7369 676e 556e 6974 3a28 302c 3230 292c 3936 2c33 323b 4172 6368 4e61 6d65
3467560 5f5f 3130 4465 7369 676e 556e 6974 3a28 302c 3230 292c 3132 382c 3332 3b44 6555 6e54 7970 655f 5f31 3044 6573 6967 6e55
3467640 6e69 743a 2830 2c31 292c 3136 302c 3332 3b41 7263 684c 696e 655f 5f31 3044 6573 6967 6e55 6e69 743a 2830 2c31 292c 3139
3467720 322c 3332 3b51 7561 6c69 6669 6564 5f5f 3130 4465 7369 676e 556e 6974 3a28 302c 3838 292c 3232 342c 3936 3b53 7562 426c
3470000 6f63 6b73 5f5f 3130 4465 7369 676e 556e 6974 3a28 302c 3838 292c 3332 302c 3936 3b3b 0044 6573 6967 6e55 6e69 743a 5a63
3470060 4465 7369 676e 556e 6974 3b4e 4f62 6a65 6374 3b5f 5f63 745f 5f31 3044 6573 6967 6e55 6e69 7446 7620 5f5f 6374 5f5f 3130
3470140 4465 7369 676e 556e 6974 4650 6320 5f5f 6374 5f5f 3130 4465 7369 676e 556e 6974 4650 3665 6e74 6974 7920 5f5f 6374 5f5f
3470220 3130 4465 7369 676e 556e 6974 4652 4331 3044 6573 6967 6e55 6e69 7420 5f5f 6474 5f5f 3130 4465 7369 676e 556e 6974 4676
3470300 2073 6574 5f44 555f 4465 556e 4e61 6d65 5f5f 3130 4465 7369 676e 556e 6974 4650 6320 5c00 7365 745f 4455 5f46 696c 654e
3470360 616d 655f 5f31 3044 6573 6967 6e55 6e69 7446 5063 2073 6574 5f44 555f 4172 6368 4e61 6d65 5f5f 3130 4465 7369 676e 556e
3470440 6974 4650 6320 7365 745f 4455 5f44 6555 6e54 7970 655f 5f31 3044 6573 6967 6e55 6e69 7446 6920 7365 745f 4455 5f41 7263
3470520 684c 696e 655f 5f31 3044 6573 6967 6e55 6e69 7446 6920 6765 745f 4455 5f46 696c 654e 616d 655f 5f31 3044 6573 6967 6e55
3470600 6e69 7446 7620 4571 7561 6c5f 5f31 3044 6573 6967 6e55 6e69 7446 5036 656e 7469 7479 205c 0069 7347 5445 5f5f 3130 4465
3470660 7369 676e 556e 6974 4650 364f 626a 6563 7420 6973 4c54 455f 5f31 3044 6573 6967 6e55 6e69 7446 5036 4f62 6a65 6374 2067
3470740 6574 5f44 555f 5175 616c 6966 6965 645f 5f31 3044 6573 6967 6e55 6e69 7446 7620 6765 745f 4455 5f53 7562 426c 6f63 6b73
3471020 5f5f 3130 4465 7369 676e 556e 6974 4676 2045 7870 616e 645f 5648 444c 5f44 555f 5f31 3044 6573 6967 6e55 6e69 7446 7620
3471100 6578 706c 6169 6e5f 5f31 3044 6573 6967 6e55 6e69 7446 5063 203b 3b3b 005f 5f70 7462 6c5f 5f31 3044 6573 6967 6e55 6e69
3471160 745f 5f41 6464 6572 5f63 7878 3a47 2830 2c33 3329 0046 696c 6555 6e69 743a 5428 302c 3130 3429 3d73 3234 5f5f 7670 7472
3471240 5f5f 364f 626a 6563 743a 2830 2c33 3329 2c30 2c33 323b 6e61 6d65 5f5f 374e 4f62 6a65 6374 3a28 302c 3230 292c 3332 2c33
3471320 323b 4669 6c65 4e61 6d65 5f5f 3846 696c 6555 6e69 743a 2830 2c32 3029 2c36 342c 3332 3b45 6e74 6974 794c 6973 745f 5f38
3471400 4669 6c65 556e 6974 3a28 302c 3838 292c 3936 2c39 363b 3b00 4669 6c65 556e 6974 3a5a 6346 696c 6555 6e69 743b 4e4f 626a
3471460 6563 743b 5f5f 6374 5f5f 3846 696c 6555 6e69 7446 7620 5f5f 6374 5f5f 3846 696c 6555 6e69 7446 5063 205f 5f63 745f 5f38
3471540 4669 6c65 556e 6974 4652 4339 4669 6c65 556e 6974 205f 5f64 745f 5f38 4669 6c65 556e 6974 4676 2073 6574 5f46 555f 4669
3471620 6c65 4e61 6d65 5f5f 3846 696c 6555 6e69 7446 5063 2067 6574 5f46 555f 4669 6c65 4e61 6d65 5f5f 3846 696c 6555 6e69 7446
3471700 7620 6765 745f 456e 7469 7479 4c69 7374 5f5f 3846 696c 6555 6e69 7446 7620 5c00 4578 7061 6e64 5f56 4844 4c5f 4455 5f5f
3471760 3846 696c 6555 6e69 7446 7620 6578 706c 6169 6e5f 5f38 4669 6c65 556e 6974 4650 6320 3b3b 3b00 5f5f 7074 626c 5f5f 3846
3472040 696c 6555 6e69 745f 5f41 6464 6572 5f63 7878 3a47 2830 2c33 3329 0041 6c6c 426c 6f63 6b73 3a54 2830 2c31 3035 293d 7334
3472120 345f 5f76 7074 725f 5f36 4f62 6a65 6374 3a29 302c 3333 292c 302c 3332 3b6e 616d 655f 5f37 4e4f 626a 6563 743a 2830 2c32
3472200 3029 2c33 322c 3332 3b42 6c6f 636b 4c69 7374 5f5f 3941 6c6c 426c 6f63 6b73 3a28 302c 3838 292c 3634 2c39 363b 4455 4c69
3472260 7374 5f5f 3941 6c6c 426c 6f63 6b73 3a28 302c 3838 292c 3136 302c 3936 3b46 554c 6973 745f 5f39 416c 6c42 6c6f 636b 733a
3472340 2830 2c38 3829 2c32 3536 2c39 363b 3b00 416c 6c42 6c6f 636b 733a 5a63 416c 6c42 6c6f 636b 733b 4e4f 626a 6563 743b 5f5f
3472420 6374 5f5f 3941 6c6c 426c 6f63 6b73 4676 205f 5f63 745f 5f39 416c 6c42 6c6f 636b 7346 5243 3941 6c6c 426c 6f63 6b73 205f
3472500 5f64 745f 5f39 416c 6c42 6c6f 636b 7346 7620 6765 745f 426c 6f63 6b4c 6973 745f 5f39 416c 6c42 6c6f 636b 7346 7620 6765
3472560 745f 4455 4c69 7374 5f5f 3941 6c6c 426c 6f63 6b73 4676 2067 6574 5f45 554c 6973 745f 5f39 416c 6c42 6c6f 636b 7346 7620
3472640 5265 6164 5f56 4844 4c5f 426c 6b46 696c 655f 5f39 416c 6c42 6c6f 636b 7346 5063 205c 0052 6576 6572 7365 5061 7261 6d4c
3472720 6973 7473 5f5f 3941 6c6c 426c 6f63 6b73 4676 206d 616b 655f 4455 4c69 7374 5f5f 3941 6c6c 426c 6f63 6b73 4676 206d 616b
```

```
3473000 655f 4655 4c69 7374 5f5f 3941 6c6c 426c 6f63 6b73 4676 2045 7870 616e 645f 5648 444c 5f46 555f 5f39 416c 6c42 6c6f 636b
3473060 7346 7620 6578 706c 6169 6e5f 5f39 416c 6c42 6c6f 636b 7346 5063 203b 3b3b 005f 5f70 7462 6c5f 5f39 416c 6c42 6c6f 636b
3473140 735f 5f41 6464 6572 5f63 7878 3a47 2830 2c33 3329 004d 475f 5370 6563 6966 6963 3a54 2830 2c31 3036 293d 7331 3274 6563
3473220 696e 6f6c 6f67 795f 5f31 314d 475f 5370 6563 6966 6963 3a28 302c 3230 292c 302c 3332 3b6c 6273 5f74 6563 684e 756d 5f5f
3473300 3131 4d47 5f53 7065 6369 6669 633a 2830 2c31 292c 3332 2c33 323b 4165 6d5f 7465 6368 4e75 6d5f 5f31 314d 475f 5370 6563
3473360 6966 6963 3a28 302c 3129 2c36 342c 3332 3b3b 004d 475f 5370 6563 6966 6963 3a5a 634d 475f 5370 6563 6966 6963 3b3b 5f5f
3473440 6374 5f5f 3131 4d47 5f53 7065 6369 6669 6346 7620 5f5f 6474 5f5f 3131 4d47 5f53 7065 6369 6669 6346 7620 7365 745f 7465
3473520 6368 6e6f 6c6f 6779 5f6e 616d 655f 5f31 314d 475f 5370 6563 6966 6963 4650 6320 6765 745f 6c62 735f 7465 6368 4e75 6d5f
3473600 5f31 314d 475f 5370 6563 6966 6963 4676 2067 6574 5f4d 656d 5f74 6563 684e 756d 5f5f 3131 4d47 5f53 7065 6369 6669 6346
3473660 7620 6765 745f 7465 6368 4e61 6d65 5f5f 3131 4d47 5f53 7065 6369 6669 6346 7620 5c00 6578 706c 6169 6e5f 5f31 314d 475f
3473740 5370 6563 6966 6963 4650 6320 3b3b 3b00 4164 6465 723a 5428 302c 3130 3729 3d73 3434 4269 7457 6964 7468 5f5f 364d 6f64
3474020 4765 6e3a 2830 2c31 292c 302c 3332 3b45 5374 6174 655f 5f36 4d6f 6447 656e 3a28 302c 3738 292c 3332 2c33 323b 5069 6e4e
3474100 616d 654c 656e 6774 685f 5f36 4d6f 6447 656e 3a28 302c 3838 292c 3634 2c39 363b 5f5f 7670 7472 5f5f 364d 6f64 4765 6e3a
3474160 2830 2c33 3329 2c31 3630 2c33 323b 7479 7065 5f5f 3541 6464 6572 3a28 302c 3230 292c 3139 322c 3332 3b6d 6169 6e5f 6d65
3474240 6e75 5f5f 3541 6464 6572 3a28 302c 3129 2c32 3234 2c33 323b 7375 625f 6d65 6e75 5f5f 3541 6464 6572 3a28 302c 3129 2c32
3474320 3536 2c33 323b 616f 6475 6c65 6e61 6d65 5f5f 3541 6464 6572 3a28 302c 3230 292c 3238 382c 3332 3b62 6974 735f 5f35 4164
3474400 6465 723a 2830 2c31 292c 3332 302c 3332 3b3b 0041 6464 6572 3a5a 6341 6464 6572 3b4d 6f64 4765 6e3b 5f5f 6374 5f5f 3541
3474460 6464 6572 4650 6320 5f5f 6374 5f5f 3541 6464 6572 4676 205f 5f63 745f 5f35 4164 6465 7246 5243 3541 6464 6572 205f 5f64
3474540 745f 5f35 4164 6465 7246 7620 7365 744e 616d 6549 6e64 6578 5f5f 3541 6464 6572 4650 6320 7365 7449 6e64 6578 5f5f 3541
3474620 6464 6572 4676 204c 6f61 645f 5648 444c 5f44 6174 615f 5f35 4164 6465 7246 5037 4e4f 626a 6563 7420 436f 6d70 6f73 655f
3474700 4d6f 6447 656e 5f44 6573 6372 6970 746f 725f 5f35 4164 6465 7246 5063 205c 003b 3b3b 005f 5f70 7462 6c5f 5f35 4164 6465
3474760 725f 5f41 6464 6572 5f63 7878 3a47 2830 2c33 3329 0074 656d 7044 473a 4728 302c 3230 2900 4447 3a47 2830 2c31 3038 293d
3475040 2a28 302c 3130 3629 0073 6574 496e 6465 785f 5f35 4164 6465 7246 763a 4628 302c 3229 005f 5f30 7468 6973 3a70 2830 2c31
3475120 3039 293d 2a28 302c 3130 3729 0041 6464 6572 2e63 7878 005f 5f30 7468 6973 3a72 2830 2c31 3039 2900 5f5f 305f 5f58 4230
3475200 3079 696a 3068 653a 2830 2c37 3829 005f 5f30 7468 6973 203a 5a74 6c00 7365 7449 6e64 6578 5f5f 3541 6464 6572 4676 203a
3475260 5a74 4600 4c6f 6164 5f56 4844 4c5f 4461 7461 5f5f 3541 6464 6572 4650 374e 4f62 6a65 6374 3a46 2830 2c32 2900 5f5f 3074
3475340 6969 733a 7028 302c 3130 3929 005f 5f30 4e3a 7028 302c 3836 2900 5f5f 3074 6869 733a 7228 302c 3130 3929 005f 5f31 423a
3475420 2830 2c31 3130 293d 2a28 302c 3130 3029 005f 5f30 5f5f 5842 3030 7969 6a30 6865 3a28 302c 3738 2900 5f5f 3074 6869 7320
3475500 3a5a 746c 005f 5f30 4e20 3a5a 746c 005f 5f31 4220 3a5a 746c 004c 6f61 645f 5648 444c 5f44 6174 615f 5f35 4164 6465 7246
3475560 5037 4e4f 626a 6563 7420 3a5a 7446 0043 6f6d 706f 7365 5f4d 6f64 4765 6e5f 4465 7363 7269 7074 6f72 5f5f 3541 6464 6572
3475640 4650 633a 4628 302c 3230 2900 5f5f 3074 6869 733a 7028 302c 3130 3929 005f 5f30 6275 6666 3a70 2830 2c32 3029 005f 5f30
3475720 7468 6973 3a72 2830 2c31 3039 2900 5f5f 3074 6869 7320 3a5a 746c 005f 5f30 6275 6666 203a 5a74 6c00 436f 6d70 6f73 655f
3476000 4d6f 6447 656e 5f44 6573 6372 6970 746f 725f 5f35 4164 6465 7246 5063 203a 5a74 4600 5f5f 7374 695f 5f41 6464 6572 5f63
3476060 7878 5f73 6574 496e 6465 785f 3a46 2830 2c32 2900 2f75 7372 2f43 432f 7375 6e34 2f69 6e63 6c2f 696f 7374 7265 616d 2e68
3476140 005f 5f73 7464 5f5f 4164 6465 725f 6378 785f 7365 7449 6e64 6578 5f3a 4628 302c 3229 005f 5f76 7462 6c5f 5f35 4164 6465
3476220 723a 4728 302c 3131 3129 3d61 7228 302c 3129 3b30 3b36 3b28 302c 3135 2900 5f5f 7674 626c 5f5f 3136 626c 6f63 6b5f 6174
3476300 7472 6962 7574 6573 5f5f 4164 6465 725f 6378 783a 4728 302c 3131 3229 3d61 7228 302c 3129 3b30 3b31 303b 2830 2c31 3529
3476360 005f 5f76 7462 6c5f 5f38 4c50 4f62 6a65 6374 5f5f 4164 6465 725f 6378 783a 4728 302c 3131 3329 3d61 7228 302c 3129 3b30
3476440 3b33 3b28 302c 3135 2900 7365 744e 616d 6549 6e64 6578 5f5f 3541 6464 6572 4650 633a 6628 302c 3229 005f 5f30 7468 6973
3476520 3a70 2830 2c31 3039 2900 5f5f 3074 3a70 2830 2c32 3029 002e 2f68 7878 2f41 6464 6572 2e68 7878 005f 5f30 7468 6973 203a
3476600 5a74 6c00 5f5f 3074 203a 5a74 6c00 7365 744e 616d 6549 6e64 6578 5f5f 3541 6464 6572 4650 6320 3a5a 7446 0073 6574 5f46
3476660 555f 4669 6c65 4e61 6d65 5f5f 3846 696c 6555 6e69 7446 5063 3a66 2830 2c32 2900 5f5f 3074 6869 733a 7028 302c 3131 3429
3476740 3d2a 2830 2c31 3034 2900 5f5f 3073 3a70 2830 2c32 3029 002f 686f 6d65 2f6f 7361 7331 2f61 2f61 622f 7372 632f 6e65 776f
3477020 626a 6563 7473 2f70 726f 672f 6878 782f 4669 6c65 556e 2e68 7878 005f 5f30 7468 6973 3a72 2830 2c31 3134 2900 5f5f 3074
3477100 6869 7320 3a5a 746c 005f 5f30 7320 3a5a 746c 0073 6574 5f46 555f 4669 6c65 4e61 6d65 5f5f 3846 696c 6555 6e69 7446 5063
3477160 203a 5a74 4600 6578 706c 6169 6e5f 5f31 3662 6c6f 636b 5f61 7474 7269 6275 7465 7346 5063 3a66 2830 2c32 2900 5f5f 3074
3477240 6869 733a 7028 302c 3131 3529 3d2a 2830 2c39 3829 005f 5f30 733a 7028 302c 3230 2900 2f68 6f6d 652f 6f73 6173 312f 612f
3477320 6162 2f73 7263 2f6e 6577 6f62 6a65 6374 732f 7072 6f67 2f68 7878 2f61 7474 7269 6275 7465 2e68 7878 005f 5f30 7468 6973
3477400 3a72 2830 2c31 3135 2900 5f5f 3074 6869 7320 3a5a 746c 005f 5f30 7320 3a5a 746c 0065 7870 6c61 696e 5f5f 3136 626c 6f63
3477460 6b5f 6174 7472 6962 7574 6573 4650 6320 3a5a 7446 0073 6574 5f70 6172 616d 6574 6572 5f76 616c 7565 5f74 7970 655f 5f39
3477540 7061 7261 6d65 7465 7246 5063 3a66 2830 2c32 2900 5f5f 3074 6869 733a 7028 302c 3937 2900 5f5f 3073 3a70 2830 2c32 3029
3477620 002f 686f 6d65 2f6f 7361 7331 2f61 2f61 622f 7372 632f 6e65 776f 626a 6563 7473 2f70 726f 672f 6878 782f 7061 7261 6d65
3477700 7465 722e 6878 7800 5f5f 3074 6869 733a 7228 302c 3937 2900 5f5f 3074 6869 7320 3a5a 746c 005f 5f30 7320 3a5a 746c 0073
3477760 6574 5f70 6172 616d 6574 6572 5f76 616c 7565 5f74 7970 655f 5f39 7061 7261 6d65 7465 7246 5063 203a 5a74 4600 6578 706c
3500040 6169 6e5f 5f38 4c50 4f62 6a65 6374 4650 633a 6628 302c 3229 005f 5f30 7468 6973 3a70 2830 2c31 3136 293d 2a28 302c 3835
```

| | | | | | | | | | | | | | | | | | | | | | | | | |
|---|---|---|---|---|---|---|---|---|---|---|---|---|---|---|---|---|---|---|---|---|---|---|---|---|
| 3500120 | 2900 | 5f5f | 3073 | 3a70 | 2830 | 2c32 | 3029 | 002f | 686f | 6d65 | 2f6f | 7361 | 7331 | 2f61 | 2f61 | 622f | 7372 | 632f | 6e65 | 776f | 626a | 6563 | 7473 | 2f68 |
| 3500200 | 7878 | 2f4c | 504f | 626a | 6563 | 745f | 6462 | 2e68 | 7878 | 005f | 5f30 | 7468 | 6973 | 3a72 | 2830 | 2c31 | 3136 | 2900 | 5f5f | 3074 | 6869 | 7320 | 3a5a | 746c |
| 3500260 | 005f | 5f30 | 7320 | 3a5a | 746c | 0065 | 7870 | 6c61 | 696e | 5f5f | 384c | 504f | 626a | 6563 | 7446 | 5063 | 203a | 5a74 | 4600 | 6973 | 4c54 | 455f | 5f37 | 4e4f |
| 3500340 | 626a | 6563 | 7446 | 5036 | 4f62 | 6a65 | 6374 | 3a66 | 2830 | 2c31 | 2900 | 5f5f | 3074 | 6869 | 733a | 7028 | 302c | 3836 | 2900 | 5f5f | 305f | 5f41 | 3339 | 3a70 |
| 3500420 | 2830 | 2c31 | 3137 | 293d | 2a28 | 302c | 3739 | 2900 | 2f68 | 6f6d | 652f | 6f73 | 6173 | 312f | 612f | 6162 | 2f73 | 7263 | 2f6e | 6577 | 6f62 | 6a65 | 6374 | 732f |
| 3500500 | 6878 | 782f | 4e4f | 626a | 6563 | 745f | 6462 | 2e68 | 7878 | 005f | 5f30 | 7468 | 6973 | 203a | 5a74 | 6c00 | 5f5f | 305f | 5f41 | 3339 | 203a | 5a74 | 6c00 | 6973 |
| 3500560 | 4c54 | 455f | 5f37 | 4e4f | 626a | 6563 | 7446 | 5036 | 4f62 | 6a65 | 6374 | 203a | 5a74 | 4600 | 6973 | 4754 | 455f | 5f37 | 4e4f | 626a | 6563 | 7446 | 5036 | 4f62 |
| 3500640 | 6a65 | 6374 | 3a66 | 2830 | 2c31 | 2900 | 5f5f | 3074 | 6869 | 733a | 7028 | 302c | 3836 | 2900 | 5f5f | 305f | 5f41 | 3338 | 3a70 | 2830 | 2c31 | 3137 | 2900 | 5f5f |
| 3500720 | 3074 | 6869 | 7320 | 3a5a | 746c | 005f | 5f30 | 5f5f | 4133 | 3820 | 3a5a | 746c | 0069 | 7347 | 5445 | 5f5f | 374e | 4f62 | 6a65 | 6374 | 4650 | 364f | 626a | 6563 |
| 3501000 | 7420 | 3a5a | 7446 | 0073 | 6574 | 5072 | 6f70 | 5f5f | 374e | 4f62 | 6a65 | 6374 | 4650 | 6366 | 3a66 | 2830 | 2c32 | 2900 | 5f5f | 3074 | 6869 | 733a | 7028 | 302c |
| 3501060 | 3936 | 2900 | 5f5f | 315f | 5f41 | 3336 | 3a70 | 2830 | 2c32 | 3029 | 005f | 5f31 | 5f5f | 4133 | 373a | 7028 | 302c | 3130 | 2900 | 5f5f | 3074 | 6869 | 7320 | 3a5a |
| 3501140 | 746c | 005f | 5f31 | 5f5f | 4133 | 3620 | 3a5a | 746c | 005f | 5f31 | 5f5f | 4133 | 3720 | 3a5a | 746c | 0073 | 6574 | 5072 | 6f70 | 5f5f | 374e | 4f62 | 6a65 | 6374 |
| 3501220 | 4650 | 6366 | 203a | 5a74 | 4600 | 7365 | 7450 | 726f | 705f | 5f37 | 4e4f | 626a | 6563 | 7446 | 5063 | 693a | 6628 | 302c | 3229 | 005f | 5f30 | 7468 | 6973 | 3a70 |
| 3501300 | 2830 | 2c38 | 3629 | 005f | 5f31 | 5f5f | 4133 | 343a | 7028 | 302c | 3230 | 2900 | 5f5f | 315f | 5f41 | 3335 | 3a70 | 2830 | 2c31 | 2900 | 5f5f | 3074 | 6869 | 7320 |
| 3501360 | 3a5a | 746c | 005f | 5f31 | 5f5f | 4133 | 3420 | 3a5a | 746c | 005f | 5f31 | 5f5f | 4133 | 3520 | 3a5a | 746c | 0073 | 6574 | 5072 | 6f70 | 5f5f | 374e | 4f62 | 6a65 |
| 3501440 | 6374 | 4650 | 6369 | 203a | 5a74 | 4600 | 7365 | 7450 | 726f | 705f | 5f37 | 4e4f | 626a | 6563 | 7446 | 5063 | 5431 | 3a66 | 2830 | 2c32 | 2900 | 5f5f | 3074 | 6869 |
| 3501520 | 733a | 7028 | 302c | 3936 | 2900 | 5f5f | 315f | 5f41 | 3332 | 3a70 | 2830 | 2c32 | 3029 | 005f | 5f31 | 5f5f | 4133 | 333a | 7028 | 302c | 3230 | 2900 | 5f5f | 3074 |
| 3501600 | 6869 | 7320 | 3a5a | 746c | 005f | 5f31 | 5f5f | 4133 | 3220 | 3a5a | 746c | 005f | 5f31 | 5f5f | 4133 | 3320 | 3a5a | 746c | 0073 | 6574 | 5072 | 6f70 | 5f5f | 374e |
| 3501660 | 4f62 | 6a65 | 6374 | 4650 | 6354 | 3120 | 3a5a | 7446 | 0067 | 6574 | 5072 | 6f70 | 5f5f | 374e | 4f62 | 6a65 | 6374 | 4650 | 6369 | 3a66 | 2830 | 2c32 | 3029 | 005f |
| 3501740 | 5f30 | 7468 | 6973 | 3a70 | 2830 | 2c38 | 3629 | 005f | 5f30 | 5f5f | 4133 | 303a | 7028 | 302c | 3230 | 2900 | 5f5f | 305f | 5f41 | 3331 | 3a70 | 2830 | 2c31 | 2900 |
| 3502020 | 5f5f | 3074 | 6869 | 7320 | 3a5a | 746c | 005f | 5f30 | 5f5f | 4133 | 3020 | 3a5a | 746c | 005f | 5f30 | 5f5f | 4133 | 3120 | 3a5a | 746c | 0067 | 6574 | 5072 | 6f70 |
| 3502100 | 5f5f | 374e | 4f62 | 6a65 | 6374 | 4650 | 6369 | 203a | 5a74 | 4600 | 6765 | 7441 | 7474 | 725f | 5f37 | 4e4f | 626a | 6563 | 7446 | 693a | 6628 | 302c | 3230 | 2900 |
| 3502160 | 5f5f | 3074 | 6869 | 733a | 7028 | 302c | 3836 | 2900 | 5f5f | 305f | 5f41 | 3239 | 3a70 | 2830 | 2c31 | 2900 | 5f5f | 3074 | 6869 | 7320 | 3a5a | 746c | 005f | 5f30 |
| 3502240 | 5f5f | 4132 | 3920 | 3a5a | 746c | 0067 | 6574 | 4174 | 7472 | 5f5f | 374e | 4f62 | 6a65 | 6374 | 4669 | 203a | 5a74 | 4600 | 696e | 4f72 | 6465 | 725f | 5f36 | 4f62 |
| 3502320 | 6a65 | 6374 | 4650 | 364f | 626a | 6563 | 743a | 6628 | 302c | 3129 | 005f | 5f30 | 7468 | 6973 | 3a70 | 2830 | 2c31 | 3137 | 2900 | 5f5f | 305f | 5f41 | 3237 | 3a70 |
| 3502400 | 2830 | 2c31 | 3137 | 2900 | 2f68 | 6f6d | 652f | 6f73 | 6173 | 312f | 612f | 6162 | 2f73 | 7263 | 2f6e | 6577 | 6f62 | 6a65 | 6374 | 732f | 6878 | 782f | 4f62 | 6a65 |
| 3502460 | 6374 | 5f64 | 622e | 6878 | 7800 | 5f5f | 3074 | 6869 | 7320 | 3a5a | 746c | 005f | 5f30 | 5f5f | 4132 | 3720 | 3a5a | 746c | 0069 | 6e4f | 7264 | 6572 | 5f5f | 364f |
| 3502540 | 626a | 6563 | 7446 | 5036 | 4f62 | 6a65 | 6374 | 203a | 5a74 | 4600 | 4d75 | 782e | 6f00 | 5f73 | 6574 | 5f70 | 6172 | 616d | 6574 | 6572 | 5f76 | 616c | 7565 | 5f74 |
| 3502620 | 7970 | 655f | 5f39 | 7061 | 7261 | 6d65 | 7465 | 7246 | 5063 | 005f | 7365 | 744e | 616d | 6549 | 6e64 | 6578 | 5f5f | 334d | 7578 | 4650 | 6300 | 5f73 | 6574 | 5072 |
| 3502700 | 6f70 | 5f5f | 374e | 4f62 | 6a65 | 6374 | 4650 | 6366 | 005f | 7365 | 7450 | 726f | 705f | 5f37 | 4e4f | 626a | 6563 | 7446 | 5063 | 6900 | 5f65 | 7870 | 6c61 | 696e |
| 3502760 | 5f5f | 3136 | 626c | 6f63 | 6b5f | 6174 | 7472 | 6962 | 7574 | 6573 | 4650 | 6300 | 5f67 | 6574 | 4174 | 7472 | 5f5f | 374e | 4f62 | 6a65 | 6374 | 4669 | 005f | 7365 |
| 3503040 | 745f | 4655 | 5f46 | 696c | 654e | 616d | 655f | 5f38 | 4669 | 6c65 | 556e | 6974 | 4650 | 6300 | 5f70 | 7574 | 5f5f | 376f | 7374 | 7265 | 616d | 4663 | 005f | 7365 |
| 3503120 | 7450 | 726f | 705f | 5f37 | 4e4f | 626a | 6563 | 7446 | 5063 | 5431 | 005f | 696f | 7374 | 7265 | 616d | 5f69 | 6e69 | 7400 | 5f69 | 734c | 5445 | 5f5f | 374e | 4f62 |
| 3503200 | 6a65 | 6374 | 4650 | 364f | 626a | 6563 | 7400 | 5f69 | 7347 | 5445 | 5f5f | 374e | 4f62 | 6a65 | 6374 | 4650 | 364f | 626a | 6563 | 7400 | 5f65 | 7870 | 6c61 | 696e |
| 3503260 | 5f5f | 384c | 504f | 626a | 6563 | 7446 | 5063 | 005f | 6765 | 7450 | 726f | 705f | 5f37 | 4e4f | 626a | 6563 | 7446 | 5063 | 6900 | 5f5f | 5f63 | 745f | 5f36 | 656e |
| 3503340 | 7469 | 7479 | 4676 | 005f | 696e | 4f72 | 6465 | 725f | 5f36 | 4f62 | 6a65 | 6374 | 4650 | 364f | 626a | 6563 | 7400 | 2f68 | 6f6d | 652f | 6f73 | 6173 | 312f | 612f |
| 3503420 | 6162 | 2f73 | 7263 | 2f6e | 6577 | 6f62 | 6a65 | 6374 | 732f | 7072 | 6f67 | 2f4d | 472f | 432b | 2b2e | 3232 | 3830 | 382f | 004d | 7578 | 2e63 | 004d | 7578 | 2e63 |
| 3503500 | 7878 | 0063 | 6e74 | 3a74 | 2830 | 2c31 | 293d | 7228 | 302c | 3129 | 3b2d | 3231 | 3437 | 3438 | 3336 | 3438 | 3b32 | 3134 | 3734 | 3833 | 3634 | 373b | 0063 | 6861 |
| 3503560 | 723a | 7428 | 302c | 3229 | 3d72 | 2830 | 2c32 | 293b | 303b | 3132 | 373b | 006c | 6f6e | 673a | 7428 | 302c | 3329 | 3d72 | 2830 | 2c31 | 293b | 2d32 | 3134 | 3734 |
| 3503640 | 3833 | 3634 | 383b | 3231 | 3437 | 3438 | 3336 | 3437 | 3b00 | 7368 | 6f72 | 743a | 7428 | 302c | 3429 | 3d72 | 2830 | 2c31 | 293b | 2d33 | 3237 | 3638 | 3b33 | 3237 |
| 3503720 | 3637 | 3b00 | 756e | 7369 | 676e | 6564 | 2063 | 6861 | 723a | 7428 | 302c | 3529 | 3d72 | 2830 | 2c31 | 293b | 303b | 3235 | 353b | 0075 | 6e73 | 6967 | 6e65 | 6420 |
| 3504000 | 7368 | 6f72 | 743a | 7428 | 302c | 3629 | 3d72 | 2830 | 2c31 | 293b | 303b | 3635 | 3533 | 353b | 0075 | 6e73 | 6967 | 6e65 | 6420 | 6c6f | 6e67 | 3a74 | 2830 | 2c37 |
| 3504060 | 293d | 7228 | 302c | 3129 | 3b30 | 3b2d | 313b | 0075 | 6e73 | 6967 | 6e65 | 6420 | 696e | 743a | 7428 | 302c | 3829 | 3d72 | 2830 | 2c31 | 293b | 303b | 2d31 | 3b00 |
| 3504140 | 666c | 6f61 | 743a | 7428 | 302c | 3929 | 3d72 | 2830 | 2c31 | 293b | 343b | 303b | 0064 | 6f75 | 626c | 653a | 7428 | 302c | 3130 | 293d | 7228 | 302c | 3129 | 3b38 |
| 3504220 | 3b30 | 3b00 | 766f | 6964 | 3a74 | 2830 | 2c31 | 3129 | 3d28 | 302c | 3131 | 2900 | 3f3f | 3f3a | 7428 | 302c | 3132 | 293d | 2830 | 2c31 | 2900 | 5f5f | 7670 | 7470 |
| 3504300 | 3a74 | 2830 | 2c31 | 3329 | 3d2a | 2830 | 2c31 | 3429 | 3d66 | 2830 | 2c31 | 2900 | 5f5f | 6d70 | 7472 | 3a54 | 2830 | 2c31 | 3529 | 3d73 | 3864 | 3a28 | 302c | 3429 |
| 3504360 | 2c30 | 2c31 | 363b | 693a | 2830 | 2c34 | 292c | 3136 | 2c31 | 363b | 663a | 2830 | 2c31 | 3329 | 2c33 | 322c | 3332 | 3b3b | 005f | 5046 | 565f | 3a74 | 2830 | 2c31 |
| 3504440 | 3629 | 3d2a | 2830 | 2c31 | 3729 | 3d66 | 2830 | 2c32 | 2900 | 5f50 | 4649 | 5f3a | 7428 | 302c | 3133 | 2900 | 6572 | 726e | 6f3a | 4728 | 302c | 3129 | 0073 | 7973 |
| 3504520 | 5f6e | 6572 | 723a | 4728 | 302c | 3129 | 0065 | 6e76 | 6972 | 6f6e | 3a47 | 2830 | 2c31 | 3929 | 3d2a | 2830 | 2c32 | 3029 | 3d2a | 2830 | 2c32 | 2900 | 656e | 643a |
| 3504600 | 4728 | 302c | 3129 | 0065 | 7465 | 7874 | 3a47 | 2830 | 2c31 | 2900 | 6564 | 6174 | 613a | 4728 | 302c | 3129 | 006f | 7074 | 6172 | 673a | 4728 | 302c | 3230 | 2900 |
| 3504660 | 6f70 | 7469 | 6e64 | 3a47 | 2830 | 2c31 | 2900 | 6f70 | 7465 | 7272 | 3a47 | 2830 | 2c31 | 2900 | 7074 | 7264 | 6966 | 665f | 743a | 7428 | 302c | 3129 | 0073 | 697a |
| 3504740 | 655f | 743a | 7428 | 302c | 3829 | 0073 | 7472 | 6561 | 6170 | 6f73 | 3a74 | 2830 | 2c31 | 2900 | 7374 | 7265 | 616d | 6f66 | 663a | 7428 | 302c | 3129 | 0069 | 6f5f |
| 3505020 | 7374 | 6174 | 653a | 5428 | 302c | 3231 | 293d | 6567 | 6f6f | 6462 | 6974 | 5f5f | 696f | 5f73 | 7461 | 7465 | 3a30 | 2c65 | 6f66 | 6269 | 745f | 5f69 | 6f5f | 7374 |
| 3505100 | 6174 | 653a | 312c | 6661 | 696c | 6269 | 745f | 5f69 | 6f5f | 7374 | 6174 | 653a | 322c | 6261 | 6462 | 6974 | 5f5f | 696f | 5f73 | 7461 | 7465 | 3a33 | 2c68 | 6172 |
| 3505160 | 6466 | 6169 | 6c5f | 5f69 | 6f5f | 7374 | 6174 | 653a | 342c | 3b00 | 6f70 | 656e | 5f6d | 6f64 | 653a | 5428 | 302c | 3232 | 293d | 6569 | 6e5f | 5f6f | 7065 | 6e5f |

```
3505240 6d6f 6465 3a30 2c6f 7574 5f5f 6f70 656e 5f64 6f64 653a 312c 6174 655f 5f6f 7065 6e5f 6d6f 6465 3a32 2c61 7070 5f5f 6f70
3505320 656e 5f6d 6f64 653a 332c 7472 756e 635f 5f6f 7065 6e5f 6d6f 6465 3a34 2c6e 6f63 7265 6174 655f 5f6f 7065 6e5f 6d6f 6465
3505400 3a35 2c6e 6f72 6570 6c61 6365 5f5f 6f70 656e 5f6d 6f64 653a 362c 3b00 7365 656b 5f64 6972 3a54 2830 2c32 3329 3d65 6265
3505460 675f 5f73 6565 6b5f 6469 723a 302c 6375 725f 5f73 6565 6b5f 6469 723a 312c 656e 645f 5f73 6565 6b5f 6469 723a 322c 3b00
3505540 5f5f 4531 3a54 2830 2c32 3429 3165 736b 6970 7773 5f5f 5f5f 4531 3a30 2c6c 6566 745f 5f5f 5f45 313a 312c 7269 6768 745f
3505620 5f5f 5f45 313a 322c 696e 7465 726e 616c 5f5f 5f5f 4531 3a33 2c64 6563 5f5f 5f5f 4531 3a34 2c6f 6374 5f5f 5f5f 4531 3a35
3505700 2c68 6578 5f5f 5f5f 4531 3a36 2c73 686f 7762 6173 655f 5f5f 5f45 313a 372c 5c00 7368 6f77 706f 696e 745f 5f5f 5f45 313a
3505760 382c 7570 7065 7263 6173 655f 5f5f 5f45 313a 392c 7368 6f77 706f 735f 5f5f 5f45 313a 3130 2c73 6369 656e 7469 6669 635f
3506040 5f5f 5f45 313a 3131 2c66 6978 6564 5f5f 5f5f 4531 3a31 322c 756e 6974 6275 665f 5f5f 5f45 313a 3133 2c73 7464 696f 5f5f
3506120 5f5f 4531 3a31 342c 3b00 5f5f 4532 3a54 2830 2c32 3529 3d65 736b 6970 7069 6e67 5f5f 5f5f 4532 3a30 2c74 6965 645f 5f5f
3506200 5f45 323a 312c 3b00 696f 733a 5428 302c 3236 293d 7336 306e 7573 6572 5f5f 3369 6f73 3a28 302c 3129 2c30 2c33 323b 785f
3506260 7573 6572 5f5f 3369 6f73 3a28 302c 3330 293d 2a28 302c 3237 293d 7875 696f 735f 7573 6572 5f75 6e69 6f6e 3a2c 3332 2c33
3506340 323b 6270 5f5f 3369 6f73 3a28 302c 3331 293d 2a28 302c 3238 293d 7873 7374 7265 616d 6275 663a 2c36 342c 3332 3b73 7461
3506420 7465 5f5f 3369 6f73 3a28 302c 3129 2c39 362c 3332 3b69 7370 6563 6961 6c5f 5f33 696f 733a 2830 2c31 292c 3132 382c 3332
3506500 3b6f 7370 6563 6961 6c5f 5f33 696f 733a 2830 2c31 292c 3136 302c 3332 3b69 7366 785f 7370 6563 6961 6c5f 5f33 696f 733a
3506560 2830 2c31 292c 3139 322c 3332 3b6f 7366 785f 7370 6563 6961 6c5f 5f33 696f 733a 2830 2c31 292c 3232 342c 3332 3b5c 0064
3506640 656c 6275 665f 5f33 696f 733a 2830 2c31 292c 3235 362c 3332 3b78 5f74 6965 5f5f 3369 6f73 3a28 302c 3332 2931 2a28 302c
3506720 3239 293d 7873 6f73 7472 6561 6d3a 2c32 3838 2c33 323b 785f 666c 6167 735f 5f33 696f 733a 2830 2c31 292c 3332 302c 3332
3507000 3b78 5f70 7265 6369 7369 6f6e 5f5f 3369 6f73 3a28 302c 3429 2c33 3532 2c31 363b 785f 6669 6c6c 5f5f 3369 6f73 3a28 302c
3507060 3229 2c33 3638 2c38 3b78 5f77 6964 7468 5f5f 3369 6f73 3a28 302c 3429 2c33 3834 2c31 363b 6173 7369 676e 5f70 7269 7661
3507140 7465 5f5f 3369 6f73 3a28 302c 3129 2c34 3136 2c33 323b 5f5f 7670 7472 5f5f 3369 6f73 3a28 302c 3333 293d 2a28 302c 3135
3507220 292c 3434 382c 3332 3b3b 0062 6173 6566 6965 6c64 5f5f 3369 6f73 3a47 2830 2c31 2900 6164 6a75 7374 6669 656c 645f 5f33
3507300 696f 733a 4728 302c 3129 0066 6c6f 6174 6669 656c 645f 5f33 696f 733a 4728 302c 3129 006e 6578 7462 6974 5f5f 3369 6f73
3507360 3a47 2830 2c31 2900 6e65 7874 776f 7264 5f5f 3369 6f73 3a47 2830 2c31 2900 7374 6469 6f66 6c75 7368 5f5f 3369 6f73 3a47
3507440 2830 2c31 3629 0969 6f73 3a5a 6369 6f73 3b3b 5f5f 6374 5f5f 3369 6f73 4650 3973 7472 6561 6d62 7566 205f 5f63 745f 5f33
3507520 696f 7346 7620 5f5f 6374 5f5f 3369 6f73 4652 3369 6f73 205f 5f64 745f 5f33 696f 7346 7620 666c 6167 735f 5f33 696f 7346
3507600 7620 666c 6167 735f 5f33 696f 7346 6c20 7365 7466 5f5f 3369 6f73 466c 5431 2073 6574 665f 5f33 696f 7346 6c20 756e 7365
3507660 7466 5f5f 3369 6f73 466c 2077 6964 7468 5f5f 3369 6f73 4669 2077 6964 7468 5f5f 3369 6f73 4669 2074 6965 5f5f 3369 6f73
3507740 4650 376f 7374 7265 616d 205c 0074 6965 5f5f 3369 6f73 4676 2066 696c 6c5f 5f33 696f 7346 6320 6669 6c6c 5f5f 3369 6f73
3510020 4676 2070 7265 6369 7369 6f6e 5f5f 3369 6f73 4669 2070 7265 6369 7369 6f6e 5f5f 3369 6f73 4676 2072 6473 7461 7465 5f5f
3510100 3369 6f73 4676 205f 5f6f 7050 765f 5f33 696f 7346 7620 5f5f 6e74 5f5f 3369 6f73 4676 2065 6f66 5f5f 3369 6f73 4676 2066
3510160 6169 6c5f 5f33 696f 7346 7620 6261 645f 5f33 696f 7346 7620 676f 6f64 5f5f 3369 6f73 4676 2063 6c65 6172 5f5f 3369 6f73
3510240 4669 2072 6462 7566 5f5f 3369 6f73 4676 205c 0069 776f 7264 5f5f 3369 6f73 4669 2070 776f 7264 5f5f 3369 6f73 4669 2062
3510320 6974 616c 6c6f 635f 5f33 696f 7353 4676 2078 616c 6c6f 635f 5f33 696f 7353 4676 2075 7265 7369 7a65 5f5f 3369 6f73 4669
3510400 2073 796e 635f 7769 7468 5f73 7464 696f 5f5f 3369 6f73 5346 7620 7365 7473 7461 7465 5f5f 3369 6f73 4669 2069 6e69 745f
3510460 5f33 696f 7346 5039 7374 7265 616d 6275 6620 5f5f 6173 5f5f 3369 6f73 4652 3369 6f73 2073 6b69 705f 5f33 696f 7346 6920
3510540 3b62 6173 6566 6965 6c64 5f5f 3369 6f73 205c 0061 646a 7573 7466 6965 6c64 5f5f 3369 6f73 2066 6c6f 6174 6669 656c 645f
3510620 5f33 696f 7320 6e65 7874 6269 745f 5f33 696f 7320 6e65 7874 776f 7264 5f5f 3369 6f73 2073 7464 696f 666c 7573 685f 5f33
3510700 696f 7320 3b3b 0073 7472 6561 6d62 7566 3a54 2830 2c32 3829 3d73 3430 616c 6c6f 635f 5f39 7374 7265 616d 6275 663a 2830
3510760 2c34 292c 302c 3136 3b78 5f75 6e62 7566 5f5f 3973 7472 6561 6d62 7566 3a28 302c 3429 2c31 362c 3136 3b78 5f62 6173 655f
3511040 5f39 7374 7265 616d 6275 663a 2830 2c32 3029 2c33 322c 3332 3b78 5f70 6261 7365 5f5f 3973 7472 6561 6d62 7566 3a28 302c
3511120 3230 292c 3634 2c33 323b 785f 7070 7472 5f5f 3973 7472 6561 6d62 7566 3a28 302c 3230 292c 3936 2c33 323b 785f 6570 7074
3511200 725f 5f39 7374 7265 616d 6275 663a 2830 2c32 3029 2c31 3238 2c33 323b 785f 6770 7472 5f5f 3973 7472 6561 6d62 7566 3a28
3511260 302c 3230 292c 3136 302c 3332 3b78 5f65 6770 7472 5f5f 3973 7472 6561 6d62 7566 3a28 302c 3230 292c 3139 322c 3332 3b5c
3511340 0078 5f65 6261 636b 5f5f 3973 7472 6561 6d62 7566 3a28 302c 3230 292c 3232 342c 3332 3b78 5f62 6c65 6e5f 5f39 7374 7265
3511420 616d 6275 663a 2830 2c31 292c 3235 362c 3332 3b5f 5f76 7074 725f 5f39 7374 7265 616d 6275 663a 2830 2c33 3329 2c32 3838
3511500 2c33 323b 3b00 7374 7265 616d 6275 663a 5a63 7374 7265 616d 6275 663b 3b5f 5f63 745f 5f39 7374 7265 616d 6275 6646 5239
3511560 7374 7265 616d 6275 6620 5f5f 6374 5f5f 3973 7472 6561 6d62 7566 4676 205f 5f63 745f 5f39 7374 7265 616d 6275 6646 5063
3511640 6920 5f5f 6374 5f5f 3973 7472 6561 6d62 7566 4650 6369 5432 205f 5f61 735f 5f39 7374 7265 616d 6275 6646 5239 7374 7265
3511720 616d 6275 6620 6462 705f 5f39 7374 7265 616d 6275 6646 7620 6261 7365 5f5f 3973 7472 6561 6d62 7566 4676 2070 6261 7365
3512000 5f5f 3973 7472 6561 6d62 7566 4676 205c 0070 7074 725f 5f39 7374 7265 616d 6275 6646 7620 6570 7074 725f 5f39 7374 7265
3512060 616d 6275 6646 7620 6770 7472 5f5f 3973 7472 6561 6d62 7566 4676 2065 6770 7472 5f5f 3973 7472 6561 6d62 7566 4676 2065
3512140 6261 636b 5f5f 3973 7472 6561 6d62 7566 4676 2065 6275 665f 5f39 7374 7265 616d 6275 6646 7620 626c 656e 5f5f 3973 7472
3512220 6561 6d62 7566 4676 2073 6574 705f 5f39 7374 7265 616d 6275 6646 5063 5431 2073 6574 675f 5f39 7374 7265 616d 6275 6646
3512300 5063 4e32 3120 7362 756d 705f 5f39 7374 7265 616d 6275 6646 6920 5c00 6762 756d 705f 5f39 7374 7265 616d 6275 6646 6920
```

3512360 7365 7462 5f5f 3973 7472 6561 6d62 7566 4650 6354 3169 2075 6e62 7566 6665 7265 645f 5f39 7374 7265 616d 6275 6646 7620
3512440 756e 6275 6666 6572 6564 5f5f 3973 7472 6561 6d62 7566 4669 2061 6c6c 6f63 6174 655f 5f39 7374 7265 616d 6275 6646 7620
3512520 646f 616c 6c6f 6361 7465 5f5f 3973 7472 6561 6d62 7566 4676 206f 7665 7266 6c6f 775f 5f39 7374 7265 616d 6275 6646 6920
3512600 756e 6465 7266 6c6f 775f 5f39 7374 7265 616d 6275 6646 7620 5c00 7062 6163 6b66 6169 6c5f 5f39 7374 7265 616d 6275 6646
3512660 6920 7379 6e63 5f5f 3973 7472 6561 6d62 7566 4676 2073 6565 6b6f 6666 5f5f 3973 7472 6561 6d62 7566 466c 3873 6565 6b5f
351274C 6469 7269 2073 6565 6b70 6f73 5f5f 3973 7472 6561 6d62 7566 466c 6920 7873 7075 746e 5f5f 3973 7472 6561 6d62 7566 4650
3513020 4363 6920 7873 6765 746e 5f5f 3973 7472 6561 6d62 7566 4650 6369 2069 6e5f 6176 6169 6c5f 5f39 7374 7265 616d 6275 6646
3513100 7620 6f75 745f 7761 6974 696e 675f 5f39 7374 7265 616d 6275 6646 7620 5c00 7367 6574 635f 5f39 7374 7265 616d 6275 6646
3513160 7620 736e 6578 7463 5f5f 3973 7472 6561 6d62 7566 4676 2073 6275 6d70 635f 5f39 7374 7265 616d 6275 6646 7620 7374 6f73
3513240 7363 5f5f 3973 7472 6561 6d62 7566 4676 2073 7575 7462 6163 6b63 5f5f 3973 7472 6561 6d62 7566 4663 2073 7075 7463 5f5f
3513320 3973 7472 6561 6d62 7566 4669 2073 7075 746e 5f5f 3973 7472 6561 6d62 7566 4650 4363 6920 7367 6574 6e5f 5f39 7374 7265
3513400 616d 6275 6646 5063 6920 7365 7462 7566 5f5f 3973 7472 6d62 7566 4650 6369 205c 0073 6574 6275 665f 5f39 7374 7265
3513460 616d 6275 6646 5055 6369 2073 6574 6275 665f 5f39 7374 7265 616d 6275 6646 5063 6954 3220 5f5f 6474 5f5f 3973 7472 6561
3513540 6d62 7566 4676 2078 5f73 6e65 7874 635f 5f39 7374 7265 616d 6275 6646 7620 3b3b 3b00 6973 7472 6561 6d3a 5428 302c 3334
3513620 293d 7337 3278 5f67 636f 756e 745f 5f37 6973 7472 6561 6d3a 2830 2c31 292c 302c 3332 3b5f 5f76 7074 725f 5f37 6973 7472
3513700 6561 6d3a 2830 2c33 3329 2c33 322c 3332 3b50 696f 733a 2830 2c33 3529 3d2a 2830 2c32 3629 2c36 342c 3332 3b4f 696f 733a
3513760 2830 2c32 3629 2c39 362c 3438 303b 3b00 6973 7472 6561 6d3a 5a63 6973 7472 6561 6d3b 696f 733b 5f5f 6374 5f5f 3769 7374
3514040 7265 616d 4650 3973 7472 6561 6d62 7566 205f 5f63 745f 5f37 6973 7472 6561 6d46 7620 5f5f 6374 5f5f 3769 7374 7265 616d
3514120 4650 3973 7472 6561 6d62 7566 6950 376f 7374 7265 616d 205f 5f63 745f 5f37 6973 7472 6561 6d46 6950 6354 3120 5f5f 6374
3514200 5f5f 3769 7374 7265 616d 4669 5431 5037 6f73 7472 6561 6d20 5f5f 6374 5f5f 3769 7374 7265 616d 4652 3769 7374 7265 616d
3514260 205f 5f64 745f 5f37 6973 7472 6561 6d46 7620 5c00 6970 6678 5f5f 3769 7374 7265 616d 4669 2069 7366 785f 5f37 6973 7472
3514340 6561 6d46 7620 7365 656b 675f 5f37 6973 7472 6561 6d46 6c20 7365 656b 675f 5f37 6973 7472 6561 6d46 6c38 7365 656b 5f64
3514420 6972 2074 656c 6c67 5f5f 3769 7374 7265 6161 4676 205f 5f72 735f 5f37 6973 7472 6561 6d46 5046 5237 6973 7472 6561 6d5f
3514500 5237 6973 7472 6561 6d20 5f5f 7273 5f5f 3769 7374 7265 616d 4650 4652 3369 6f73 5f52 3369 6f73 205f 5f72 735f 5f37 6973
3514560 7472 6561 6d46 5063 205f 5f72 735f 5f37 6973 7472 6561 6d46 5055 6320 5c00 5f5f 7273 5f5f 3769 7374 7265 616d 4652 5563
3514640 205f 5f72 735f 5f37 6973 7472 6561 6d46 5263 205f 5f72 735f 5f37 6973 7472 6561 6d46 5273 205f 5f72 735f 5f37 6973 7472
3514720 6561 6d46 5269 205f 5f72 735f 5f37 6973 7472 6561 6d46 526c 205f 5f72 735f 5f37 6973 7472 6561 6d46 5255 7320 5f5f 7273
3515000 5f5f 3769 7374 7265 616d 4652 5569 205f 5f72 735f 5f37 6973 7472 6561 6d46 5255 6c20 5f5f 7273 5f5f 3769 7374 7265 616d
3515060 4652 6620 5f5f 7273 5f5f 3769 7374 7265 616d 4652 6420 5f5f 7273 5f5f 3769 7374 7265 616d 4650 3973 7472 6561 6d62 7566
3515140 205c 0067 6574 5f5f 3769 7374 7265 616d 4650 6369 6320 6765 745f 5f37 6973 7472 6561 6d46 5055 6369 6320 6765 745f 5f37
3515220 6973 7472 6561 6d46 5239 7374 7265 616d 6275 6663 2067 6574 5f5f 3769 7374 7265 616d 4652 5563 2067 6574 5f5f 3769 7374
3515300 7265 616d 4652 6320 6765 745f 5f37 6973 7472 6561 6d46 7620 6765 746c 696e 655f 5f37 6973 7472 6561 6d46 5063 6963 2067
3515360 6574 6c69 6e65 5f5f 3769 7374 7265 616d 4650 5563 6963 2070 6565 6b5f 5f37 6973 7472 6561 6d46 7620 6967 6e6f 7265 5f5f
3515440 3769 7374 7265 616d 4669 5431 205c 0072 6561 645f 5f37 6973 7472 6561 6d46 5063 6920 7265 6164 5f5f 3769 7374 7265 616d
3515520 4650 5563 6920 6763 6f75 6e74 5f5f 3769 7374 7265 616d 4676 2070 7574 6261 636b 5f5f 3769 7374 7265 616d 4663 2073 796e
3515600 635f 5f37 6973 7472 6561 6d46 7620 646f 5f69 7066 785f 5f37 6973 7472 6561 6d46 6920 6561 7477 6869 7465 5f5f 3769 7374
3515660 7265 616d 4676 2078 6765 745f 5f37 6973 7472 6561 6d46 5063 203b 3b3b 006f 7374 7265 616d 3a54 2830 2c32 3929 3d73 3638
3515740 5f5f 7670 7472 5f5f 376f 7374 7265 616d 3a28 302c 3333 292c 302c 3332 3b50 696f 733a 2830 2c33 3529 2c33 322c 3332 3b4f
3516020 696f 733a 2830 2c32 3629 2c36 342c 3438 303b 3b00 6f73 7472 6561 6d3a 5a63 6f73 7472 6561 6d3b 696f 733b 5f5f 6374 5f5f
3516100 376f 7374 7265 616d 4650 3973 7472 6561 6d62 7566 205f 5f63 745f 5f37 6f73 7472 6561 6d46 7620 5f5f 6374 5f5f 376f 7374
3516160 7265 616d 4669 205f 5f63 745f 5f37 6f73 7472 6561 6d46 6950 6320 5f5f 6374 5f5f 376f 7374 7265 616d 4652 376f 7374 7265
3516240 616d 205f 5f64 745f 5f37 6f73 7472 6561 6d46 7620 6f70 6678 5f5f 376f 7374 7265 616d 4676 206f 7366 785f 5f37 6f73 7472
3516320 6561 6d46 7620 666c 7573 685f 5f37 6f73 7472 6561 6d46 7620 5c00 7365 656b 705f 5f37 6f73 7472 6561 6d46 6c20 7365 656b
3516400 705f 5f37 6f73 7472 6561 6d46 6c38 7365 656b 5f64 6972 2074 656c 6c70 5f5f 376f 7374 7265 616d 4676 2070 7574 5f5f 376f
3516460 7374 7265 616d 4663 205f 5f6c 735f 5f37 6f73 7472 6561 6d46 6320 5f5f 6c73 5f5f 376f 7374 7265 616d 4655 6320 5f5f 6c73
3516540 5f5f 376f 7374 7265 616d 4650 4363 205f 5f6c 735f 5f37 6f73 7472 6561 6d46 6920 5f5f 6c73 5f5f 376f 7374 7265 616d 466c
3516620 205f 5f6c 735f 5f37 6f73 7472 6561 6d46 6420 5f5f 6c73 5f5f 376f 7374 7265 616d 4666 205c 005f 5f6c 735f 5f37 6f73 7472
3516700 6561 6d46 5569 205f 5f6c 735f 5f37 6f73 7472 6561 6d46 556c 205f 5f6c 735f 5f37 6f73 7472 6561 6d46 5076 205f 5f6c 735f
3516760 5f37 6f73 7472 6561 6d46 5039 7374 7265 6164 6275 6620 5f5f 6c73 5f5f 376f 7374 7265 616d 4673 205f 5f6c 735f 5f37 6f73
3517040 7472 6561 6d46 5573 205f 5f6c 735f 5f37 6f73 7472 6561 6d46 5046 5237 6f73 7472 6561 6d5f 5237 6f73 7472 6561 6d20 5f5f
3517120 6c73 5f5f 376f 7374 7265 616d 4650 4652 3369 6f73 5f52 3369 6f73 2077 7269 7465 5f5f 376f 7374 7265 616d 4650 4363 6920
3517200 5c00 7772 6974 655f 5f37 6f73 7472 6561 6d46 5043 5563 6920 646f 5f6f 7066 785f 5f37 6f73 7472 6561 6d46 7620 646f 5f6f
3517260 7366 785f 5f37 6f73 7472 6561 6d46 7620 3b3b 3b00 7075 745f 5f37 6f73 7472 6561 6d46 633a 6628 302c 3336 293d 2a28 302c
3517340 3239 2900 5f5f 3074 6869 733a 7028 302c 3336 2900 5f5f 3063 3a70 2830 2c32 2900 2f75 7372 2f43 432f 7375 6e34 2f69 6e63
3517420 6c2f 696f 7374 7265 616d 2e68 005f 5f30 7468 6973 3a72 2830 2c33 3629 005f 5f30 7468 6973 203a 5a74 6c00 5f5f 3063 203a

```
3517500 5a74 6c00 7075 745f 5f37 6f73 7472 6561 6d46 6320 3a5a 7446 0069 6f73 7472 6561 6d3a 5428 302c 3337 293d 7339 307d 5f67
3517560 636f 756e 745f 5f37 6973 7472 6561 6d3a 2830 2c31 292c 302c 3332 3b5f 5f76 7074 725f 5f37 6973 7472 6561 6d3a 2830 2c33
3517640 3329 2c33 322c 3332 3b50 696f 733a 2830 2c33 3529 2c36 342c 3332 3b4f 6f73 7472 6561 6d3a 2830 2c32 3929 2c39 362c 3534
3517720 343b 3b00 696f 7374 7265 616d 3a5a 6369 6f73 7472 6561 6d3b 6973 7472 6561 6320 6f73 7472 6561 6d20 696f 733b 5f5f 6374
3520000 5f5f 3869 6f73 7472 6561 6d46 5039 7374 7265 616d 6275 6620 5f5f 6374 5f5f 3869 6f73 7472 6561 6d46 7620 5f5f 6374 5f5f
3520060 3869 6f73 7472 6561 6d46 5238 696f 7374 7265 616d 205f 5f64 745f 5f38 696f 7374 7265 616d 4676 203b 3b3b 0063 696e 3a47
3520140 2830 2c33 3829 3d78 7369 7374 7265 616d 5f77 6974 6861 7373 6967 6e3a 0063 6f75 743a 4728 302c 3339 293d 7873 6f73 7472
3520220 6561 6d5f 7769 7468 6173 7369 676e 3a00 6365 7272 3a47 2830 2c33 3929 0063 6c6f 673a 4728 302c 3339 2900 496f 7374 7265
3520300 616d 5f69 6e69 743a 5428 302c 3430 293d 7331 5f5f 5739 5f5f 3133 496f 7374 7265 616d 5f69 6e69 743a 2830 2c32 292c 302c
3520360 383b 3b00 7374 6473 7461 7475 735f 5f31 3349 6f73 7472 6561 6d5f 696e 6974 3a47 2830 2c31 2900 696e 6974 636f 756e 745f
3520440 5f31 3349 6f73 7472 6561 6d5f 696e 6974 3a47 2830 2c31 2900 496f 7374 7265 616d 5f69 6e69 743a 5a63 496f 7374 7265 616d
3520520 5f69 6e69 743b 3b5f 5f63 745f 5f31 3349 6f73 7472 6561 6d5f 696e 6974 4676 205f 5f64 745f 5f31 3349 6f73 7472 6561 6d5f
3520600 696e 6974 4676 203b 7374 6473 7461 7475 735f 5f31 3349 6f73 7472 6561 6d5f 696e 6974 2069 6e69 7463 6f75 6e74 5f5f 3133
3520660 496f 7374 7265 616d 5f69 6e69 7420 3b40 696f 733b 0069 6f73 7472 6561 6d5f 696e 6974 3a53 2830 2c34 3029 0047 5054 3a74
3520740 2830 2c31 3329 0073 6d61 6e69 705f 696e 743a 5428 302c 3431 293d 7333 6663 745f 5f31 3073 6d61 6e69 705f 696e 743a 2830
3521020 2c34 3229 3d2a 2830 2c34 3329 3d56 2830 2c33 3529 2c30 2c33 323b 6172 675f 5f31 3073 6d61 6e69 705f 696e 743a 2830 2c31
3521100 292c 3332 2c33 323b 3b00 736d 616e 6970 5f69 6e74 3a5a 6373 6d61 6e69 705f 696e 743b 3b5f 5f63 745f 5f31 3073 6d61 6e69
3521160 705f 696e 7446 5046 5233 696f 7369 5f52 3369 6f73 6920 3b3b 5f5f 6c73 5f5f 4652 376f 7374 7265 616d 5231 3073 6d61 6e69
3521240 705f 696e 7420 5f5f 7273 5f5f 4652 3769 7374 7265 616d 5231 3073 6d61 6e69 705f 696e 7420 3b00 7361 7070 6c79 5f69 6e74
3521320 3a54 2830 2c34 3429 3d73 3466 6374 5f5f 3130 7361 7070 6c79 5f69 6e74 3a28 302c 3432 292c 302c 3332 3b3b 0073 6170 706c
3521400 795f 696e 743a 5a63 7361 7070 6c79 5f69 6e74 3b3b 5f5f 6374 5f5f 3130 7361 7070 6c79 5f69 6e74 4650 4652 3369 6f73 695f
3521460 5233 696f 7320 5f5f 636c 5f5f 3130 7361 7070 6c79 5f69 6e74 4669 203b 3b3b 0069 6d61 6e69 705f 696e 743a 5428 302c 3435
3521540 293d 7338 6663 745f 5f31 3069 6d61 6e69 705f 696e 743a 2830 2c34 3629 3d2a 2830 2c34 3729 3d66 2830 2c34 3829 3d2a 2830
3521620 2c33 3429 2c30 2c33 323b 6172 675f 5f31 3069 6d61 6e69 705f 696e 743a 2830 2c31 292c 3332 2c33 323b 3b00 696d 616e 6970
3521700 5f69 6e74 3a5a 6369 6d61 6e69 705f 696e 743b 3b5f 5f63 745f 5f31 3069 6d61 6e69 705f 696e 7446 5046 5237 6973 7472 6561
3521760 6d69 5f52 3769 7374 7265 616d 6920 3b3b 5f5f 7273 5f5f 4652 3769 7374 7265 616d 5231 3069 6d61 6e69 705f 696e 7420 3b00
3522040 6961 7070 6c79 5f69 6e74 3a54 2830 2c34 3929 3d73 3466 6374 5f5f 3130 6961 7070 6c79 5f69 6e74 3a28 302c 3436 292c 302c
3522120 3332 3b3b 0069 6170 706c 795f 696e 743a 5a63 6961 7070 6c79 5f69 6e74 3b3b 5f5f 6374 5f5f 3130 6961 7070 6c79 5f69 6e74
3522200 4650 4652 3769 7374 7265 616d 695f 5237 6973 7472 6561 6d20 5f5f 636c 5f5f 3130 6961 7070 6c79 5f69 6e74 4669 203b 3b3b
3522260 006f 6d61 6e69 705f 696e 743a 5428 302c 3530 293d 7338 6663 745f 5f31 306f 6d61 6e69 705f 696e 743a 2830 2c35 3129 3d2a
3522340 2830 2c35 3229 3d66 2830 2c33 3629 2c30 2c33 323b 6172 675f 5f31 306f 6d61 6e69 705f 696e 743a 2830 2c31 292c 3332 2c33
3522420 323b 3b00 6f6d 616e 6970 5f69 6e74 3a5a 636f 6d61 6e69 705f 696e 743b 3b5f 5f63 745f 5f31 306f 6d61 6e69 705f 696e 7446
3522500 5046 5237 6f73 7472 6561 6d69 5f52 376f 7374 7265 616d 6920 3b3b 5f5f 6c73 5f5f 4652 376f 7374 7265 616d 5231 306f 6d61
3522560 6e69 705f 696e 7420 3b00 6f61 7070 6c79 5f69 6e74 3a54 2830 2c35 3329 3d73 3466 6374 5f5f 3130 6f61 7070 6c79 5f69 6e74
3522640 3a28 302c 3531 292c 302c 3332 3b3b 006f 6170 706c 795f 696e 743a 5a63 6f61 7070 6c79 5f69 6e74 3b3b 5f5f 6374 5f5f 3130
3522720 6f61 7070 6c79 5f69 6e74 4650 4652 376f 7374 7265 616d 695f 5237 6f73 7472 6561 6d20 5f5f 636c 5f5f 3130 6f61 7070 6c79
3523000 5f69 6e74 4669 203b 3b3b 0069 6f6d 616e 6970 5f69 6e74 3a54 2830 2c35 3429 3d73 3866 6374 5f5f 3131 696f 6d61 6e69 705f
3523060 696e 743a 2830 2c35 3529 3d2a 2830 2c35 3629 3d66 2830 2c35 3729 3d2a 2830 2c33 3729 2c30 2c33 323b 6172 675f 5f31 3169
3523140 6f6d 616e 6970 5f69 6e74 3a28 302c 3129 2c33 322c 3332 3b3b 0069 6f6d 616e 6970 5f69 6e74 3a5a 6369 6f6d 616e 6970 5f69
3523220 6e74 3b3b 5f5f 6374 5f5f 3131 696f 6d61 6e69 705f 696e 7446 5046 5238 696f 7374 7265 616d 695f 5238 696f 7374 7265 616d
3523300 6920 3b3b 5f5f 6c73 5f5f 4652 3869 6f73 7472 6561 6d52 3131 696f 6d61 6e69 705f 696e 7420 5f5f 7273 5f5f 4652 3869 6f73
3523360 7472 6561 6d52 3131 696f 6d61 6e69 705f 696e 7420 3b00 696f 6170 706c 795f 696e 743a 5428 302c 3538 293d 7334 6663 745f
3523440 5f31 3169 6f61 7070 6c79 5f69 6e74 3a28 302c 3535 292c 302c 3332 3b3b 0069 6f61 7070 6c79 5f69 6e74 3a5a 6369 6f61 7070
3523520 6c79 5f69 6e74 3b3b 5f5f 6374 5f5f 3131 696f 6170 706c 795f 696e 7446 5046 5238 696f 7374 7265 616d 695f 5238 696f 7374
3523600 7265 616d 205f 5f63 6c5f 5f31 3169 6f61 7070 6c79 5f69 6e74 4669 203b 3b3b 0073 6d61 6e69 705f 6c6f 6e67 3a54 2830 2c35
3523660 3929 3d73 3866 6374 5f5f 3131 736d 616e 6970 5f6c 6f6e 673a 2830 2c34 3229 2c30 2c33 323b 6172 675f 5f31 3173 6d61 6e69
3523740 705f 6c6f 6e67 3a28 302c 3129 2c33 322c 3332 3b3b 0073 6d61 6e69 705f 6c6f 6e67 3a5a 6373 6d61 6e69 705f 6c6f 6e67 3b3b
3524020 5f5f 6374 5f5f 3131 736d 616e 6970 5f6c 6f6e 6746 5046 5233 696f 736c 5f52 3369 6f73 6c20 3b3b 5f5f 6c73 5f5f 4652 376f
3524100 7374 7265 616d 5231 3173 6d61 6e69 705f 6c6f 6e67 205f 5f72 735f 5f46 5237 6973 7472 6561 6d52 3131 736d 616e 6970 5f6c
3524160 6f6e 6720 3b00 7361 7070 6c79 5f6c 6f6e 673a 5428 302c 3630 293d 7334 6663 745f 5f31 3173 6170 706c 795f 6c6f 6e67 3a28
3524240 302c 3432 292c 302c 3332 3b3b 0073 6170 706c 795f 6c6f 6e67 3a5a 6373 6170 706c 795f 6c6f 6e67 3b3b 5f5f 6374 5f5f 3131
3524320 7361 7070 6c79 5f6c 6f6e 6746 5046 5233 696f 736c 5f52 3369 6f73 205f 5f63 6c5f 5f31 3173 6170 706c 795f 6c6f 6e67 466c
3524400 203b 3b3b 0069 6d61 6e69 705f 6c6f 6e67 3a54 2830 2c36 3129 3d73 3866 6374 5f5f 3131 696d 616e 6970 5f6c 6f6e 673a 2830
3524460 2c34 3629 2c30 2c33 323b 6172 675f 5f31 3169 6d61 6e69 705f 6c6f 6e67 3a28 302c 3129 2c33 322c 3332 3b3b 0069 6d61 6e69
3524540 705f 6c6f 6e67 3a5a 6369 6d61 6e69 705f 6c6f 6e67 3b3b 5f5f 6374 5f5f 3131 696d 616e 6970 5f6c 6f6e 6746 5046 5237 6973
```

```
3524620 7472 6561 6d6c 5f52 3769 7374 7265 616d 6c20 3b3b 5f5f 7273 5f5f 4652 3769 7374 7265 616d 5231 3169 6d61 6e69 705f 6c6f
3524700 6e67 203b 0069 6170 706c 795f 6c6f 6e67 3a54 2830 2c36 3229 3d73 3466 6374 5f5f 3131 6961 7070 6c79 5f6c 6f6e 673a 2830
3524760 2c34 3629 2c30 2c33 323b 3b00 6961 7070 6c79 5f6c 6f6e 673a 5a63 6961 7070 6c79 5f6c 6f6e 673b 3b5f 5f63 745f 5f31 3169
3525040 6170 706c 795f 6c6f 6e67 4650 4652 3769 7374 7265 616d 6c5f 5237 6973 7472 6561 6d20 5f5f 636c 5f5f 3131 6961 7070 6c79
3525120 5f6c 6f6e 6746 6c20 3b3b 3b00 6f6d 616e 6970 5f6c 6f6e 673a 5428 302c 3633 293d 7338 6663 745f 5f31 316f 6d61 6e69 705f
3525200 6c6f 6e67 3a28 302c 3531 292c 302c 3332 3b3b 006f 6170 706c 795f 6c6f 6e67 3a5a 636f 6170 706c 795f 6c6f 6e67 3b3b 5f5f
3525260 3b00 6f6d 616e 6970 5f6c 6f6e 673a 5a63 6f6d 616e 6970 5f6c 6f6e 673b 3b5f 5f63 745f 5f31 316f 6161 6e69 705f 6c6f 6e67
3525340 4650 4652 376f 7374 7265 616d 6c5f 5237 6f73 7472 6561 6d6c 203b 3b5f 5f6c 735f 5f46 5237 6f73 7472 6561 6d52 3131 6f6d
3525420 616e 6970 5f6c 6f6e 6720 3b00 6f61 7070 6c79 5f6c 6f6e 673a 5428 302c 3634 293d 7334 6663 745f 5f31 316f 6170 706c 795f
3525500 6c6f 6e67 3a28 302c 3531 292c 302c 3332 3b3b 006f 6170 706c 795f 6c6f 6e67 3a5a 636f 6170 706c 795f 6c6f 6e67 3b3b 5f5f
3525560 6374 5f5f 3131 6f61 7070 6c79 5f6c 6f6e 6746 5046 5237 6f73 7472 6561 6d6c 5f52 376f 7374 7265 616d 205f 5f63 6c5f 5f31
3525640 316f 6170 706c 795f 6c6f 6e67 466c 203b 3b3b 0069 6f6d 616e 6970 5f6c 6f6e 673a 5428 302c 3635 293d 7338 6663 745f 5f31
3525720 3269 6f6d 616e 6970 5f6c 6f6e 673a 2830 2c35 3529 2c30 2c33 323b 6172 675f 5f31 3269 6f6d 616e 6970 5f6c 6f6e 673a 2830
3526000 2c31 292c 3332 2c33 323b 3b00 696f 6d61 6e69 705f 6c6f 6e67 3a5a 6369 6f6d 616e 6970 5f6c 6f6e 673b 3b5f 5f63 745f 5f31
3526060 3269 6f6d 616e 6970 5f6c 6f6e 6746 5046 5238 696f 7374 7265 616d 6c5f 5238 696f 7374 7265 616d 6c20 3b3b 5f5f 6c73 5f5f
3526140 4652 3869 6f73 7472 6561 6d52 3132 696f 6d61 6e69 705f 6c6f 6e67 205f 5f72 735f 5f46 5238 696f 7374 7265 616d 5231 3269
3526220 6f6d 616e 6970 5f6c 6f6e 6720 3b00 696f 6170 706c 795f 6c6f 6e67 3a54 2830 2c36 3629 3d73 3466 6374 5f5f 3132 696f 6170
3526300 706c 795f 6c6f 6e67 3a28 302c 3535 292c 302c 3332 3b3b 0069 6f61 7070 6c79 5f6c 6f6e 673a 5a63 696f 6170 706c 795f 6c6f
3526360 6e67 3b3b 5f5f 6374 5f5f 3132 696f 6170 706c 795f 6c6f 6e67 4650 4652 3869 6f73 7472 6561 6d6c 5f52 3869 6f73 7472 6561
3526440 6d20 5f5f 636c 5f5f 3132 696f 6170 706c 795f 6c6f 6e67 466c 203b 3b3b 0073 7464 696f 6275 663a 5428 302c 3637 293d 7335
3526520 3261 6c6c 6f63 5f5f 3973 7472 6561 6d62 7566 3a28 302c 3429 2c30 2c31 363b 785f 756e 6275 665f 5f39 7374 7265 616d 6275
3526600 663a 2830 2c34 292c 3136 2c31 363b 785f 6261 7365 5f5f 3973 7472 6561 6d62 7566 3a28 302c 3230 292c 3332 2c33 323b 785f
3526660 7062 6173 655f 5f39 7374 7265 616d 6275 663a 2830 2c32 3029 2c36 342c 3332 3b78 5f70 7074 725f 5f39 7374 7265 616d 6275
3526740 663a 2830 2c32 3029 2c39 362c 3332 3b78 5f65 7070 7472 5f5f 3973 7472 6561 6d62 7566 3a28 302c 3230 292c 3132 382c 3332
3527020 3b78 5f67 7074 725f 5f39 7374 7265 616d 6275 663a 2830 2c32 3029 2c31 3630 2c33 323b 785f 6567 7074 725f 5f39 7374 7265
3527100 616d 6275 663a 2830 2c32 3029 2c31 3932 2c33 323b 5c00 785f 6562 6163 6b5f 5f39 7374 7265 616d 6275 663a 2830 2c32 3029
3527160 2c32 3234 2c33 323b 785f 626c 656e 5f5f 3973 7472 6561 6d62 7566 3a28 302c 3129 2c32 3536 2c33 323b 5f5f 7670 7472 5f5f
3527240 3973 7472 6561 6362 7566 3a28 302c 3333 292c 3238 382c 3332 3b56 705f 5f38 7374 6469 6f62 7566 3a28 302c 3638 293d 2a28
3527320 302c 3138 293d 7873 5f69 6f62 7566 3a2c 3332 302c 3332 3b6c 6173 745f 6f70 5f5f 3873 7464 696f 6275 663a 2830 2c31 292c
3527400 3335 322c 3332 3b62 7566 5f5f 3873 7464 696f 6275 663a 2830 2c36 3929 3d61 7228 302c 3129 3b30 3b31 3b28 302c 3229 2c33
3527460 3834 2c31 363b 3b00 7374 6469 6f62 7566 3a5a 6373 7464 696f 6275 663b 7374 7265 616d 6275 663b 6f76 6572 666c 6f77 5f5f
3527540 3873 7464 696f 6275 6646 6920 756e 6465 7266 6c6f 775f 5f38 7374 6469 6f62 7566 4676 2073 796e 635f 5f38 7374 6469 6f62
3527620 7566 4676 2073 6565 6b6f 6666 5f5f 3873 7464 696f 6275 6646 6c38 7365 656b 5f64 6972 6920 7062 6163 6b66 6169 6c5f 5f38
3527700 7374 6469 6f62 7566 4669 205f 5f63 745f 5f38 7374 6469 6f62 7566 4650 365f 696f 6275 6620 5f5f 6374 5f5f 3873 7464 696f
3527760 6275 6646 5243 3873 7464 696f 6275 6620 5c00 7374 6469 6f66 696c 655f 5f38 7374 6469 6f62 7566 4676 205f 5f64 745f 5f38
3530040 7374 6469 6f62 7566 4676 203b 3b3b 0066 696c 6562 7566 3a54 2830 2c37 3029 3d73 3634 616c 6c6f 635f 5f39 7374 7265 616d
3530120 6275 663a 2830 2c34 292c 302c 3136 3b78 5f75 6e62 7566 5f5f 3973 7472 6561 6d62 7566 3a28 302c 3429 2c31 362c 3136 3b78
3530200 5f62 6173 655f 5f39 7374 7265 616d 6275 663a 2830 2c32 3029 2c33 322c 3332 3b78 5f70 6261 7365 5f5f 3973 7472 6561 6d62
3530260 7566 3a28 302c 3230 292c 3634 2c33 323b 785f 7070 7472 5f5f 3973 7472 6561 6d62 7566 3a28 302c 3230 292c 3936 2c33 323b
3530340 785f 6570 7074 725f 5f39 7374 7265 616d 6275 663a 2830 2c32 3029 2c31 3238 2c33 323b 785f 6770 7472 5f5f 3973 7472 6561
3530420 6d62 7566 3a28 302c 3230 292c 3136 302c 3332 3b78 5f65 6770 7472 5f5f 3973 7472 6561 6d62 7566 3a28 302c 3230 292c 3139
3530500 322c 3332 3b5c 0078 5f65 6261 636b 5f5f 3973 7472 6561 6d62 7566 3a28 302c 3230 292c 3232 342c 3332 3b78 5f62 6c65 6e5f
3530560 5f39 7374 7265 616d 6275 663a 2830 2c31 292c 3235 362c 3332 3b5f 5f76 7074 725f 5f39 7374 7265 616d 6275 663a 2830 2c33
3530640 3329 2c32 3038 2c33 323b 7866 645f 5f37 6669 6c65 6275 663a 2830 2c31 292c 3332 302c 3332 3b6d 6f64 655f 5f37 6669 6c65
3530720 6275 663a 2830 2c31 292c 3335 322c 3332 3b6f 7065 6e65 645f 5f37 6669 6c65 6275 663a 2830 2c32 292c 3338 342c 383b 6c61
3531000 7374 5f73 6565 6b5f 5f37 6669 6c65 6275 663a 2830 2c31 292c 3431 362c 3332 3b69 6e5f 7374 6172 745f 5f37 6669 6c65 6275
3531060 663a 2830 2c32 3029 2c34 3438 2c33 323b 6c61 6865 6164 5f5f 3766 696c 6562 7566 3a28 302c 3639 292c 3438 302c 3136 3b3b
3531140 006f 7065 6e79 726f 745f 5f37 6669 6c65 6275 663a 4728 302c 3129 0066 696c 6562 7566 3a5a 6366 696c 6562 7566 3b73 7472
3531220 6561 6d62 7566 3b5f 5f63 745f 5f37 6669 6c65 6275 6646 7620 5f5f 6374 5f5f 3766 696c 6562 7566 4669 205f 5f63 745f 5f37
3531300 6669 6c65 6275 6646 6950 6354 3120 5f5f 6374 5f5f 3766 696c 6562 7566 4652 4337 6669 6c65 6275 6620 6973 5f6f 7065 6e5f
3531360 5f37 6669 6c65 6275 6646 7620 6664 5f5f 3766 696c 6562 7566 4676 206f 7065 6e5f 5f37 6669 6c65 6275 6646 5043 6369 5432
3531440 2061 7474 6163 685f 5f37 6669 6c65 6275 6646 6920 636c 6f73 655f 5f37 6669 6c65 6275 6646 7620 5c00 5f5f 6474 5f5f 3766
3531520 696c 6562 7566 4676 206f 7665 7266 6c6f 775f 5f37 6669 6c65 6275 6646 6920 756e 6465 7266 6c6f 775f 5f37 6669 6c65 6275
3531600 6646 7620 7379 6e63 5f5f 3766 696c 6562 7566 4676 2073 6565 6b6f 6666 5f5f 3766 696c 6562 7566 465c 3873 6565 6b5f 6469
3531660 7269 2073 6574 6275 665f 5f37 6669 6c65 6275 6646 5063 6920 6c61 7374 5f6f 705f 5f37 6669 6c65 6275 6646 7620 3b6f 7065
```

```
3531740 6e70 726f 745f 5f37 6669 6c65 6275 6620 3b3b 0066 7374 7265 616d 6261 7365 3a54 2830 2c37 3129 3d73 3133 3262 7566 5f5f
3532020 3131 6673 7472 6561 6d62 6173 653a 2830 2c37 3029 2c30 2c35 3132 3b5f 5f76 7074 725f 5f31 3166 7374 7265 616d 6261 7365
3532100 3a28 302c 3333 292c 3531 322c 3332 3b50 696f 733a 2830 2c33 3529 2c35 3434 2c33 323b 4f69 6f73 3a28 302c 3236 292c 3537
3532160 362c 3438 303b 3b00 6673 7472 6561 6d62 6173 653a 5a63 6673 7472 6561 6d62 6173 653b 696f 733b 5f5f 6374 5f5f 3131 6673
3532240 7472 6561 6d62 6173 6546 7620 5f5f 6374 5f5f 3131 6673 7472 6561 6d62 6173 6546 5043 6369 5432 205f 5f63 745f 5f31 3166
3532320 7374 7265 616d 6261 7365 4669 205f 5f63 745f 5f31 3166 7374 7265 616d 6261 7365 4669 5063 5431 205f 5f63 745f 5f31 3166
3532400 7374 7265 616d 6261 7365 4652 3131 6673 7472 6561 6d62 6173 6520 5f5f 6474 5f5f 3131 6673 7472 6561 6d62 6173 6546 7620
3532460 6f70 656e 5f5f 3131 6673 7472 6561 6d62 6173 6546 5043 6369 5432 205c 0061 7474 6163 685f 5f31 3166 7374 7265 616d 6261
3532540 7365 4669 2063 6c6f 7365 5f5f 3131 6673 7472 6561 6d62 6173 6546 7620 7365 7462 7566 5f5f 3131 6673 7472 6561 6d62 6173
3532620 6546 5063 6920 7264 6275 665f 5f31 3166 7374 7265 616d 6261 7365 4676 2076 6572 6966 795f 5f31 3166 7374 7265 616d 6261
3532700 7365 4669 203b 3b3b 0073 7461 7465 5f76 616c 7565 3a74 2830 2c32 3129 0056 616c 7565 5f54 7970 653a 5428 302c 3732 293d
3532760 6555 4e4b 4e4f 574e 563a 302c 5354 5249 4e47 3a31 2c49 4e54 4547 4552 3a32 2c46 4c4f 4154 3a33 2c3b 0042 6c6f 636b 5f54
3533040 7970 653a 5428 302c 3733 293d 6555 4e4b 4e4f 574e 423a 302c 454e 5449 5459 3a31 2c46 554e 4354 494f 4e3a 322c 5052 4f43
3533120 4544 5552 453a 332c 3b00 456e 7469 7479 5f54 7970 653a 5428 302c 3734 293d 6555 4e4b 4e4f 574e 453a 302c 4152 4348 4954
3533200 4543 5455 5245 3a31 2c53 5542 5052 4f47 5241 4d3a 322c 3b00 5069 6e5f 5479 7065 3a54 2830 2c37 3529 3d65 554e 4b4e 4f57
3533260 4e50 3a30 2c49 4e50 494e 3a31 2c4f 5554 5049 4e3a 322c 494e 4f55 5450 494e 3a33 2c3b 0050 6172 615f 436c 6173 733a 5428
3533340 302c 3736 293d 6555 4e4b 4e4f 574e 433a 302c 464f 524d 414c 3a31 2c41 4354 5541 4c3a 322c 5245 534f 4c56 4544 3a33 2c3b
3533420 0042 4f4f 4c45 414e 3a54 2830 2c37 3729 3d65 4661 6c73 653a 302c 5472 7565 3a31 2c3b 0042 6f6f 6c65 616e 3a54 2830 2c37
3533500 3829 3d65 6661 6c73 653a 302c 7472 7565 3a31 2c3b 0042 7566 6665 723a 4728 302c 3230 2900 4f62 6a65 6374 3a54 2830 2c37
3533560 3929 3d73 345f 5f76 7074 725f 5f36 4f62 6a65 6374 3a28 302c 3333 292c 302c 3332 3b3b 004f 626a 6563 743a 5a63 4f62 6a65
3533640 6374 3b3b 5f5f 6374 5f5f 364f 626a 6563 7446 7620 5f5f 6374 5f5f 364f 626a 6563 7446 5243 364f 626a 6563 7420 6572 726f
3533720 724d 656d 6f72 795f 5f36 4f62 6a65 6374 4650 6354 3120 6578 706c 6169 6e5f 5f36 4f62 6a65 6374 4650 6320 696e 4f72 6465
3534000 725f 5f36 4f62 6a65 6374 4650 364f 626a 6563 7420 3b3b 3b00 5f5f 7074 626c 5f5f 364f 626a 6563 745f 5f4d 7578 5f63 7878
3534060 3a47 2830 2c33 3329 0050 463a 7428 302c 3135 2900 5046 433a 7428 302c 3135 2900 5046 493a 7428 302c 3135 2900 4e4f 626a
3534140 6563 743a 5428 302c 3830 293d 7338 5f5f 7670 7472 5f5f 364f 626a 6563 743a 2830 2c33 3329 2c30 2c33 323b 6e61 6d65 5f5f
3534220 374e 4f62 6a65 6374 3a28 302c 3230 292c 3332 2c33 323b 3b00 4e4f 626a 6563 743a 5a63 4e4f 626a 6563 743b 4f62 6a65 6374
3534300 3b5f 5f63 745f 5f37 4e4f 626a 6563 7446 5063 205f 5f63 745f 5f37 4e4f 626a 6563 7446 5243 374e 4f62 6a65 6374 2073 6574
3534360 4e61 6d65 5f5f 374e 4f62 6a65 6374 4650 6320 6765 744e 616d 655f 5f37 4e4f 626a 6563 7446 7620 6578 706c 6169 6e5f 5f37
3534440 4e4f 626a 6563 7446 5063 2067 6574 4174 7472 5f5f 374e 4f62 6a65 6374 4669 2067 6574 5072 6f70 5f5f 374e 4f62 6a65 6374
3534520 4650 6369 2073 6574 5072 6f70 5f5f 374e 4f62 6a65 6374 4650 6354 3120 5c00 7365 7450 726f 705f 5f37 4e4f 626a 6563 7446
3534600 5063 6920 7365 7450 726f 705f 5f37 4e4f 626a 6563 7446 5063 6620 6973 4754 455f 5f37 4e4f 626a 6563 7446 5036 4f62 6a65
3534660 6374 2069 734c 5445 5f5f 374e 4f62 6a65 6374 4650 364f 626a 6563 7420 3b3b 3b00 6f73 7472 6561 6d5f 7769 7468 6173 7369
3534740 676e 3a54 2830 2c33 3929 3d73 3638 5f5f 7670 7472 5f5f 376f 7374 7265 616d 3a28 302c 3333 292c 302c 3332 3b50 696f 733a
3535020 2830 2c33 3529 2c33 322c 3332 3b4f 696f 733a 2830 2c32 3629 2c36 342c 3438 303b 3b00 6f73 7472 6561 6d5f 7769 7468 6173
3535100 7369 676e 3a5a 636f 7374 7265 616d 5f77 6974 6861 7373 6967 6e3b 6f73 7472 6561 6d20 696f 733b 5f5f 6374 5f5f 3138 6f73
3535160 7472 6561 6d5f 7769 7468 6173 7369 676e 4676 205f 5f63 745f 5f31 386f 7374 7265 616d 5f77 6974 6861 7373 6967 6e46 5231
3535240 386f 7374 7265 616d 5f77 6974 6861 7373 6967 6e20 5f5f 6474 5f5f 3138 6f73 7472 6561 6d5f 7769 7468 6173 7369 676e 4676
3535320 205f 5f61 735f 5f31 386f 7374 7265 616d 5f77 6974 6861 7373 6967 6e46 5237 6f73 7472 6561 6d20 5c00 5f5f 6173 5f5f 3138
3535400 6f73 7472 6561 6d5f 7769 7468 6173 7369 676e 4650 3973 7472 6561 6d62 7566 203b 3b3b 0050 4642 3a74 2830 2c31 3529 004c
3535460 4e4f 626a 6563 743a 5428 302c 3831 293d 7331 325f 5f76 7074 725f 5f36 4f62 6a65 6374 3a28 302c 3333 292c 302c 3332 3b6e
3535540 616d 655f 5f37 4e4f 626a 6563 743a 2830 2c32 3029 2c33 322c 3332 3b6e 6578 745f 5f38 4c4e 4f62 6a65 6374 3a28 302c 3832
3535620 293d 2a28 302c 3931 292c 3634 2c33 323b 3b00 4c4e 4f62 6a65 6374 3a5a 634c 4e4f 626a 6563 743b 4e4f 626a 6563 743b 5f5f
3535700 6374 5f5f 384c 4e4f 626a 6563 7446 5063 5038 4c4e 4f62 6a65 6374 205f 5f63 745f 5f38 4c4e 4f62 6a65 6374 4652 4338 4c4e
3535760 4f62 6a65 6374 2073 6574 4e65 7874 5f5f 384c 4e4f 626a 6563 7446 5038 4c4e 4f62 6a65 6374 2067 6574 4e65 7874 5f5f 384c
3536040 4e4f 626a 6563 7446 7620 3b3b 3b00 4c4f 626a 6563 743a 5428 302c 3833 293d 7338 5f5f 7670 7472 5f5f 364f 626a 6563 743a
3536120 2830 2c33 3329 2c30 2c33 323b 6e65 7874 5f5f 374c 4f62 6a65 6374 3a28 302c 3834 293d 2a28 302c 3833 292c 3332 2c33 323b
3536200 3b00 4c4f 626a 6563 743a 5a63 4c4f 626a 6563 743b 4f62 6a65 6374 3b5f 5f63 745f 5f37 4c4f 626a 6563 7446 5037 4c4f 626a
3536260 6563 7420 5f5f 6374 5f5f 374c 4f62 6a65 6374 4652 4337 4c4f 626a 6563 7420 7365 744e 6578 745f 5f37 4c4f 626a 6563 7446
3536340 5037 4c4f 626a 6563 7420 6765 744e 6578 745f 5f37 4c4f 626a 6563 7446 7620 3b3b 3b00 4c50 4f62 6a65 6374 3a54 2830 2c38
3536420 3529 3d73 3132 5f5f 7670 7472 5f5f 364f 626a 6563 743a 2830 2c33 3329 2c30 2c33 323b 6e65 7874 5f5f 374c 4f62 6a65 6374
3536500 3a28 302c 3834 292c 3332 2c33 323b 6e6f 626a 7074 725f 5f38 4c50 4f62 6a65 6374 3a28 302c 3836 293d 2a28 302c 3830 292c
3536560 3634 2c33 323b 3b00 4c50 4f62 6a65 6374 3a5a 634c 504f 626a 6563 743b 4c4f 626a 6563 743b 5f5f 6374 5f5f 384c 504f 626a
3536640 6563 7446 5037 4e4f 626a 6563 7450 374c 4f62 6a65 6374 205f 5f63 745f 5f38 4c50 4f62 6a65 6374 4652 4338 4c50 4f62 6a65
3536720 6374 2073 6574 4f62 6a65 6374 5f5f 384c 504f 626a 6563 7446 5037 4e4f 626a 6563 7420 6765 744f 626a 6563 745f 5f38 4c50
3537000 4f62 6a65 6374 4676 2065 7870 6c61 696e 5f5f 384c 504f 626a 6563 7446 5063 203b 3b3b 005f 5f70 7462 6c5f 5f38 4c50 4f62
```

| | | | | | | | | | | | | | | | | | | | | | | | | |
|---|---|---|---|---|---|---|---|---|---|---|---|---|---|---|---|---|---|---|---|---|---|---|---|---|
| 3537060 | 6a65 | 6374 | 5f5f | 4d75 | 785f | 6378 | 783a | 4728 | 302c | 3333 | 2900 | 4c69 | 7374 | 3a54 | 2830 | 2c38 | 3729 | 3d73 | 3132 | 636f | 756e | 745f | 5f34 | 4c69 |
| 3537140 | 7374 | 3a28 | 302c | 3129 | 2c30 | 2c33 | 323b | 7074 | 724c | 4f62 | 6a65 | 6374 | 5f5f | 344c | 6973 | 743a | 2830 | 2c38 | 3429 | 2c33 | 322c | 3332 | 3b5f | 5f76 |
| 3537220 | 7074 | 725f | 5f34 | 4c69 | 7374 | 3a28 | 302c | 3333 | 292c | 3634 | 2c33 | 323b | 3b00 | 4c69 | 7374 | 3a5a | 634c | 6973 | 743b | 3b5f | 5f63 | 745f | 5f34 | 4c69 |
| 3537300 | 7374 | 4676 | 205f | 5f63 | 745f | 5f34 | 4c69 | 7374 | 4652 | 4334 | 4c69 | 7374 | 205f | 5f64 | 745f | 5f34 | 4c69 | 7374 | 4676 | 2367 | 6574 | 436f | 756e | 745f |
| 3537360 | 5f34 | 4c69 | 7374 | 4676 | 2067 | 6574 | 546f | 705f | 5f34 | 4c69 | 7374 | 4676 | 2073 | 6574 | 546f | 705f | 5f34 | 4c69 | 7374 | 4650 | 374c | 4f62 | 6a65 | 6374 |
| 3537440 | 2065 | 7272 | 6f72 | 4d65 | 6d6f | 7279 | 5f5f | 344c | 6973 | 7446 | 5063 | 5431 | 2062 | 726f | 6164 | 6361 | 7374 | 5f5f | 344c | 6973 | 7446 | 4d36 | 4f62 | 6a65 |
| 3537520 | 6374 | 4676 | 5f76 | 2065 | 7870 | 6c61 | 696e | 5f5f | 344c | 6973 | 7446 | 5063 | 205c | 0069 | 6e73 | 6572 | 745f | 5f34 | 4c69 | 7374 | 4650 | 374c | 4f62 | 6a65 |
| 3537600 | 6374 | 2069 | 734d | 656d | 6265 | 725f | 5f34 | 4c69 | 7374 | 4650 | 374c | 4f62 | 6a65 | 6374 | 2069 | 734d | 656d | 6265 | 725f | 5f34 | 4c69 | 7374 | 4650 | 6320 |
| 3537660 | 6973 | 4571 | 7561 | 6c5f | 5f34 | 4c69 | 7374 | 4652 | 344c | 6973 | 7420 | 7265 | 6d6f | 7665 | 5f5f | 344c | 6973 | 7446 | 5063 | 203b | 3b3b | 005f | 5f70 | 7462 |
| 3537740 | 6c5f | 5f34 | 4c69 | 7374 | 5f5f | 4d75 | 785f | 6378 | 783a | 4728 | 302c | 3333 | 2900 | 504c | 6973 | 743a | 5428 | 302c | 3838 | 293d | 7331 | 3263 | 6f75 | 6e74 |
| 3540020 | 5f5f | 344c | 6973 | 743a | 2830 | 2c31 | 292c | 302c | 3332 | 3b70 | 7472 | 4c4f | 626a | 6563 | 745f | 5f34 | 4c69 | 7374 | 3a28 | 302c | 3834 | 292c | 3332 | 2c33 |
| 3540100 | 323b | 5f5f | 7670 | 7472 | 5f5f | 344c | 6973 | 743a | 2830 | 2c33 | 3329 | 2c36 | 342c | 3332 | 3b3b | 0050 | 4c69 | 7374 | 3a5a | 6350 | 4c69 | 7374 | 3b4c | 6973 |
| 3540160 | 743b | 696e | 7365 | 7274 | 5f5f | 3550 | 4c69 | 7374 | 4650 | 384c | 504f | 626a | 6563 | 7420 | 696e | 7365 | 7274 | 5f5f | 3550 | 4c69 | 7374 | 4652 | 3550 | 4c69 |
| 3540240 | 7374 | 2053 | 6f72 | 745f | 504c | 6973 | 745f | 5f35 | 504c | 6973 | 7446 | 6920 | 7265 | 7665 | 7273 | 655f | 5f35 | 504c | 6973 | 7446 | 7620 | 696e | 7365 | 7274 |
| 3540320 | 4166 | 7465 | 725f | 5f35 | 504c | 6973 | 7446 | 5038 | 4c50 | 4f62 | 6a65 | 6374 | 5431 | 2072 | 656d | 6f76 | 655f | 5f35 | 504c | 6973 | 7446 | 5038 | 4c50 | 4f62 |
| 3540400 | 6a65 | 6374 | 2072 | 656d | 6f76 | 655f | 5f35 | 504c | 6973 | 7446 | 5063 | 2069 | 734d | 656d | 6265 | 725f | 5f35 | 504c | 6973 | 7446 | 5063 | 205c | 0069 | 734d |
| 3540460 | 656d | 6265 | 725f | 5f35 | 504c | 6973 | 7446 | 5037 | 4c4f | 626a | 6563 | 7420 | 6973 | 4571 | 7561 | 6c5f | 5f35 | 504c | 6973 | 7446 | 5234 | 4c69 | 7374 | 2065 |
| 3540540 | 7870 | 6c61 | 696e | 5f5f | 3550 | 4c69 | 7374 | 4650 | 6320 | 5f5f | 6374 | 5f5f | 3550 | 4c69 | 7374 | 4652 | 4335 | 504c | 6973 | 7420 | 5f5f | 6374 | 5f5f | 3550 |
| 3540620 | 4c69 | 7374 | 4676 | 203b | 3b3b | 005f | 5f70 | 7462 | 6c5f | 5f35 | 504c | 6973 | 745f | 5f4d | 7578 | 5f63 | 7878 | 3a47 | 2830 | 2c33 | 3329 | 004c | 6973 | 7449 |
| 3540700 | 7465 | 7261 | 746f | 723a | 5428 | 302c | 3839 | 293d | 7338 | 6c69 | 7374 | 5f5f | 3132 | 4c69 | 7374 | 4974 | 6572 | 6174 | 6f72 | 3a28 | 302c | 3930 | 293d | 2a28 |
| 3540760 | 302c | 3837 | 292c | 302c | 3332 | 3b70 | 5f5f | 3132 | 4c69 | 7374 | 4974 | 6572 | 6174 | 6f72 | 3a28 | 302c | 3834 | 292c | 3332 | 2c33 | 323b | 3b00 | 4c69 | 7374 |
| 3541040 | 4974 | 6572 | 6174 | 6f72 | 3a5a | 634c | 6973 | 7449 | 7465 | 7261 | 746f | 723b | 3b5f | 5f63 | 745f | 5f31 | 324c | 6973 | 7449 | 7465 | 7261 | 746f | 7246 | 5234 |
| 3541120 | 4c69 | 7374 | 2072 | 6573 | 6574 | 5f5f | 3132 | 4c69 | 7374 | 4974 | 6572 | 6174 | 6f72 | 4676 | 2061 | 7474 | 6163 | 685f | 5f31 | 324c | 6973 | 7449 | 7465 | 7261 |
| 3541200 | 746f | 7246 | 5234 | 4c69 | 7374 | 2067 | 6574 | 4375 | 7272 | 656e | 745f | 5f31 | 324c | 6973 | 7449 | 7465 | 7261 | 746f | 7246 | 7620 | 5f5f | 7070 | 5f5f | 3132 |
| 3541260 | 4c69 | 7374 | 4974 | 6572 | 6174 | 6f72 | 4676 | 203b | 3b3b | 0050 | 696e | 4c65 | 6e67 | 7468 | 3a54 | 2830 | 2c39 | 3129 | 3d73 | 3136 | 5f5f | 7670 | 7472 | 5f5f |
| 3541340 | 364f | 626a | 6563 | 743a | 2830 | 2c33 | 3329 | 2c30 | 2c33 | 323b | 6e61 | 6d65 | 5f5f | 374e | 4f62 | 6a65 | 6374 | 3a28 | 302c | 3230 | 292c | 3332 | 2c33 | 323b |
| 3541420 | 436c | 656e | 6774 | 685f | 5f39 | 5069 | 6e4c | 656e | 6774 | 683a | 2830 | 2c32 | 3029 | 2c36 | 342c | 3332 | 3b49 | 6c65 | 6e67 | 7468 | 5f5f | 3950 | 696e | 4c65 |
| 3541500 | 6e67 | 7468 | 3a28 | 302c | 3129 | 2c39 | 362c | 3332 | 3b3b | 0050 | 696e | 4c65 | 6e67 | 7468 | 3a5a | 6350 | 696e | 4c65 | 6e67 | 7468 | 3b4e | 4f62 | 6a65 | 6374 |
| 3541560 | 3b5f | 5f63 | 745f | 5f39 | 5069 | 6e4c | 656e | 6774 | 6846 | 5063 | 5431 | 205f | 5f63 | 745f | 5f39 | 5069 | 6e4c | 656e | 6774 | 6846 | 5243 | 3950 | 696e | 4c65 |
| 3541640 | 6e67 | 7468 | 2073 | 6574 | 5f50 | 696e | 4c65 | 6e67 | 7468 | 5f5f | 3950 | 696e | 4c65 | 6e67 | 7468 | 4650 | 6354 | 3120 | 6765 | 745f | 495f | 5069 | 6e4c | 656e |
| 3541720 | 6774 | 685f | 5f39 | 5069 | 6e4c | 656e | 6774 | 6846 | 7620 | 6765 | 745f | 495f | 5069 | 6e4c | 656e | 6774 | 685f | 5f39 | 5069 | 6e4c | 656e | 6774 | 6846 | 6920 |
| 3542000 | 3b3b | 3b00 | 4d6f | 6447 | 656e | 3a54 | 2830 | 2c39 | 3229 | 3d73 | 3234 | 4269 | 7457 | 6964 | 7468 | 5f5f | 364d | 6f64 | 4765 | 6e3a | 2830 | 2c31 | 292c | 302c |
| 3542060 | 3332 | 3b45 | 5374 | 6174 | 655f | 5f36 | 4d6f | 6447 | 656e | 3a28 | 302c | 3738 | 292c | 3332 | 2c33 | 323b | 5069 | 6e4e | 616d | 654c | 656e | 6774 | 685f | 5f36 |
| 3542140 | 4d6f | 6447 | 656e | 3a28 | 302c | 3838 | 292c | 3634 | 2c39 | 363b | 5f5f | 7670 | 7472 | 5f5f | 364d | 6f64 | 4765 | 6e3a | 2830 | 2c33 | 3329 | 2c31 | 3630 | 2c33 |
| 3542220 | 323b | 3b00 | 4d6f | 6447 | 656e | 3a5a | 634d | 6f64 | 4765 | 6e3b | 3b5f | 5f63 | 745f | 5f36 | 4d6f | 6447 | 656e | 4676 | 205f | 5f63 | 745f | 5f36 | 4d6f | 6447 |
| 3542300 | 656e | 4652 | 4336 | 4d6f | 6447 | 656e | 2073 | 6574 | 5f42 | 6974 | 5769 | 6474 | 685f | 5f36 | 4d6f | 6447 | 656e | 4669 | 2073 | 6574 | 5f45 | 5374 | 6174 | 655f |
| 3542360 | 5f36 | 4d6f | 6447 | 656e | 4637 | 426f | 6f6c | 6561 | 6e20 | 6765 | 745f | 4553 | 7461 | 7465 | 5f5f | 364d | 6f64 | 4765 | 6e46 | 7620 | 7365 | 745f | 5069 | 6e4c |
| 3542440 | 656e | 6774 | 685f | 5f36 | 4d6f | 6447 | 656e | 4650 | 6354 | 3120 | 6765 | 745f | 5069 | 6e4c | 656e | 6774 | 685f | 5f36 | 4d6f | 6447 | 656e | 4650 | 6320 | 7365 |
| 3542520 | 7449 | 6e64 | 6578 | 5f5f | 364d | 6f64 | 4765 | 6e46 | 7620 | 5c00 | 7365 | 744e | 616d | 6549 | 6e64 | 6578 | 5f5f | 364d | 6f64 | 4765 | 6e46 | 5063 | 204c | 6f61 |
| 3542600 | 645f | 5648 | 444c | 5f44 | 6174 | 615f | 5f36 | 4d6f | 6447 | 656e | 4650 | 374e | 4f62 | 6a65 | 6374 | 2043 | 6f6d | 706f | 7365 | 5f4d | 6f64 | 4765 | 6e5f | 4465 |
| 3542660 | 7363 | 7269 | 7074 | 6f72 | 5f5f | 364d | 6f64 | 4765 | 6e46 | 5063 | 2065 | 7870 | 6c61 | 696e | 5f5f | 364d | 6f64 | 4765 | 6e46 | 7620 | 5f5f | 6474 | 5f5f | 364d |
| 3542740 | 6f64 | 4765 | 6e46 | 7620 | 3b3b | 3b00 | 5f5f | 7074 | 626c | 5f5f | 364d | 6f64 | 4765 | 6e5f | 5f4d | 7578 | 5f63 | 7878 | 3a47 | 2830 | 2c33 | 3329 | 0049 | 4f5f |
| 3543020 | 4d61 | 6e61 | 6765 | 723a | 5428 | 302c | 3933 | 293d | 7333 | 3669 | 6670 | 5f5f | 3130 | 494f | 5f4d | 616e | 6167 | 6572 | 3a28 | 302c | 3638 | 292c | 302c | 3332 |
| 3543100 | 3b6f | 6670 | 5f5f | 3130 | 494f | 5f4d | 616e | 6167 | 6572 | 3a28 | 302c | 3638 | 292c | 3332 | 2c33 | 323b | 6d66 | 705f | 5f31 | 3049 | 4f5f | 4d61 | 6e61 | 6765 |
| 3543160 | 723a | 2830 | 2c36 | 3829 | 2c36 | 342c | 3332 | 3b63 | 6670 | 5f5f | 3130 | 494f | 5f4d | 616e | 6167 | 6572 | 3a28 | 302c | 3638 | 292c | 3936 | 2c33 | 323b | 4946 |
| 3543240 | 696c | 654e | 616d | 655f | 5f31 | 3049 | 4f5f | 4d61 | 6e61 | 6765 | 723a | 2830 | 2c32 | 3029 | 2c31 | 3238 | 2c33 | 323b | 4f46 | 696c | 654e | 616d | 655f | 5f31 |
| 3543320 | 3049 | 4f5f | 4d61 | 6e61 | 6765 | 723a | 2830 | 2c32 | 3029 | 2c31 | 3630 | 2c33 | 323b | 4d46 | 696c | 654e | 616d | 655f | 5f31 | 3049 | 4f5f | 4d61 | 6e61 | 6765 |
| 3543400 | 723a | 2830 | 2c32 | 3029 | 2c31 | 3932 | 2c33 | 323b | 4346 | 696c | 654e | 616d | 655f | 5f31 | 3049 | 4f5f | 4d61 | 6e61 | 6765 | 723a | 2830 | 2c32 | 3029 | 2c32 |
| 3543460 | 3234 | 2c33 | 323b | 6375 | 4c69 | 6e65 | 5f5f | 3130 | 494f | 5f4d | 616e | 6167 | 6572 | 3a28 | 302c | 3129 | 2c32 | 3536 | 2c33 | 323b | 3b00 | 494f | 5f4d | 616e |
| 3543540 | 6167 | 6572 | 3a5a | 6349 | 4f5f | 4d61 | 6e61 | 6765 | 723b | 3b5f | 5f63 | 745f | 5f31 | 3049 | 4f5f | 4d61 | 6e61 | 6765 | 7246 | 5063 | 205f | 5f64 | 745f | 5f31 |
| 3543620 | 3049 | 4f5f | 4d61 | 6e61 | 6765 | 7246 | 7620 | 494f | 4368 | 6563 | 6b5f | 5f31 | 3049 | 4f5f | 4d61 | 6e61 | 6765 | 7246 | 7620 | 436f | 7079 | 4669 | 6c65 | 546f |
| 3543700 | 4c69 | 6e65 | 5f5f | 3130 | 494f | 5f4d | 616e | 6167 | 6572 | 4669 | 2043 | 6f70 | 7946 | 696c | 6554 | 6f45 | 6e64 | 5f5f | 3130 | 494f | 5f4d | 616e | 6167 | 6572 |
| 3543760 | 4676 | 2053 | 7461 | 746d | 656e | 7448 | 616e | 6465 | 6c65 | 725f | 5f31 | 3049 | 4f5f | 4d61 | 6e61 | 6765 | 7246 | 5063 | 5431 | 6920 | 5c00 | 436f | 7079 | 4669 |
| 3544040 | 6c65 | 546f | 4b65 | 7957 | 5f5f | 3130 | 494f | 5f4d | 616e | 6167 | 6572 | 4650 | 6354 | 3120 | 4561 | 745f | 5374 | 6174 | 656d | 656e | 745f | 5f31 | 3049 | 4f5f |
| 3544120 | 4d61 | 6e61 | 6765 | 7246 | 5063 | 5431 | 2057 | 5f4f | 7574 | 4669 | 6c65 | 5f5f | 3130 | 494f | 5f4d | 616e | 6167 | 6572 | 4650 | 6320 | 575f | 4d46 | 696c | 655f |

| | | | | | | | | | | | | | | | | | | | | | | | | |
|---|---|---|---|---|---|---|---|---|---|---|---|---|---|---|---|---|---|---|---|---|---|---|---|---|
| 3544200 | 5f31 | 3049 | 4f5f | 4d61 | 6e61 | 6765 | 7246 | 5063 | 2057 | 5f43 | 4669 | 6c65 | 5f5f | 3130 | 494f | 5f4d | 616e | 6167 | 6572 | 4650 | 6320 | 3b3b | 3b00 | 5f5f |
| 3544260 | 4335 | 353a | 5428 | 302c | 3934 | 293d | 7534 | 7376 | 616c | 7565 | 3a28 | 302c | 3230 | 292c | 302c | 3332 | 3b69 | 7661 | 6c75 | 653a | 2830 | 2c31 | 292c | 302c |
| 3544340 | 3332 | 3b66 | 7661 | 6c75 | 653a | 2830 | 2c39 | 292c | 302c | 3332 | 3b3b | 005f | 5f43 | 3535 | 3a5a | 635f | 5f43 | 3535 | 3b3b | 3b3b | 3b00 | 4765 | 6e56 | 616c |
| 3544420 | 7565 | 3a54 | 2830 | 2c39 | 3529 | 3d73 | 3136 | 5f5f | 7670 | 7472 | 5f5f | 364f | 626a | 6563 | 743a | 2830 | 2c33 | 3329 | 2c30 | 2c33 | 323b | 6e61 | 6d65 | 5f5f |
| 3544500 | 374e | 4f62 | 6a65 | 6374 | 3a28 | 302c | 3230 | 292c | 3332 | 2c33 | 323b | 7479 | 7065 | 5f5f | 3847 | 656e | 5661 | 6c75 | 653a | 2830 | 2c37 | 3229 | 2c36 | 342c |
| 3544560 | 3332 | 3b5f | 5f4f | 3535 | 5f5f | 3847 | 656e | 5661 | 6c75 | 653a | 2830 | 2c39 | 3429 | 2c39 | 362c | 3332 | 3b3b | 0047 | 656e | 5661 | 6c75 | 653a | 5a63 | 4765 |
| 3544640 | 6e56 | 616c | 7565 | 3b4e | 4f62 | 6a65 | 6374 | 3b5f | 5f63 | 745f | 5f38 | 4765 | 6e56 | 616c | 7565 | 4676 | 205f | 5f63 | 745f | 5f38 | 4765 | 6e56 | 616c | 7565 |
| 3544720 | 4652 | 4338 | 4765 | 6e56 | 616c | 7565 | 205f | 5f64 | 745f | 5f38 | 4765 | 6e56 | 616c | 7565 | 4676 | 2073 | 6574 | 5f47 | 656e | 5661 | 6c75 | 655f | 7479 | 7065 |
| 3545000 | 5f5f | 3847 | 656e | 5661 | 6c75 | 6546 | 5063 | 6920 | 7365 | 745f | 4765 | 6e56 | 616c | 7565 | 5f74 | 7970 | 655f | 5f38 | 4765 | 6e56 | 616c | 7565 | 4631 | 3056 |
| 3545060 | 616c | 7565 | 5f54 | 7970 | 6520 | 7365 | 745f | 4765 | 6e56 | 616c | 7565 | 5f5f | 3847 | 656e | 5661 | 6c75 | 6546 | 5063 | 205c | 0073 | 6574 | 5f47 | 656e | 5661 |
| 3545140 | 6c75 | 655f | 5f38 | 4765 | 6e56 | 616c | 7565 | 4669 | 2073 | 6574 | 5f47 | 656e | 5661 | 6c75 | 655f | 5f38 | 4765 | 6e56 | 616c | 7565 | 4666 | 2067 | 6574 | 5f47 |
| 3545220 | 656e | 5661 | 6c75 | 655f | 7479 | 7065 | 5f5f | 3847 | 656e | 5661 | 6c75 | 6546 | 7620 | 6765 | 745f | 4765 | 6e56 | 616c | 7565 | 5f73 | 5f5f | 3847 | 656e | 5661 |
| 3545300 | 6c75 | 6546 | 7620 | 6765 | 745f | 4765 | 6e56 | 616c | 7565 | 5f69 | 5f5f | 3847 | 656e | 5661 | 6c75 | 6546 | 7620 | 6765 | 745f | 4765 | 6e56 | 616c | 7565 | 5f66 |
| 3545360 | 5f5f | 3847 | 656e | 5661 | 6c75 | 6546 | 7620 | 6578 | 706c | 6169 | 6e5f | 5f38 | 4765 | 6e56 | 616c | 7565 | 4650 | 6320 | 5c00 | 6368 | 6563 | 6b5f | 5f38 | 4765 |
| 3545440 | 6e56 | 616c | 7565 | 4669 | 203b | 3b3b | 005f | 5f70 | 7462 | 6c5f | 5f38 | 4765 | 6e56 | 616c | 7565 | 5f5f | 4d75 | 785f | 6378 | 783a | 4728 | 302c | 3333 | 2900 |
| 3545520 | 7061 | 7261 | 6d65 | 7465 | 723a | 5428 | 302c | 3936 | 293d | 7336 | 305f | 5f76 | 7074 | 725f | 5f36 | 4f62 | 6a65 | 6374 | 3a28 | 302c | 3333 | 292c | 302c | 3332 |
| 3545600 | 3b6e | 616d | 655f | 5f37 | 4e4f | 626a | 6563 | 743a | 2830 | 2c32 | 3029 | 2c33 | 322c | 3332 | 3b6e | 616d | 655f | 5f39 | 7061 | 7261 | 6d65 | 7465 | 723a | 2830 |
| 3545660 | 2c32 | 3029 | 2c36 | 342c | 3332 | 3b74 | 7970 | 655f | 5f39 | 7061 | 7261 | 6d65 | 7465 | 723a | 2830 | 2c32 | 3029 | 2c39 | 362c | 3332 | 3b72 | 616e | 6765 | 5f5f |
| 3545740 | 3970 | 6172 | 616d | 6574 | 6572 | 3a28 | 302c | 3230 | 292c | 3132 | 382c | 3332 | 3b73 | 6c69 | 6365 | 5f5f | 3970 | 6172 | 616d | 6574 | 6572 | 3a28 | 302c | 3230 |
| 3546020 | 292c | 3136 | 302c | 3332 | 3b53 | 6c6f | 775f | 5f39 | 7061 | 7261 | 6d65 | 7465 | 723a | 2830 | 2c31 | 292c | 3139 | 322c | 3332 | 3b53 | 6869 | 6768 | 5f5f | 3970 |
| 3546100 | 6172 | 616d | 6574 | 6572 | 3a28 | 302c | 3129 | 2c32 | 3234 | 2c33 | 323b | 5c00 | 5043 | 6c61 | 7373 | 5f5f | 3970 | 6172 | 616d | 6574 | 6572 | 3a28 | 302c | 3736 |
| 3546160 | 292c | 3235 | 362c | 3332 | 3b50 | 5852 | 6566 | 5f5f | 3970 | 6172 | 616d | 6574 | 6572 | 3a28 | 302c | 3937 | 293d | 2a28 | 302c | 3936 | 292c | 3238 | 382c | 3332 |
| 3546240 | 3b6d | 6f64 | 655f | 5f39 | 7061 | 7261 | 6d65 | 7465 | 723a | 2830 | 2c37 | 3529 | 2c33 | 3230 | 2c33 | 323b | 7661 | 6c75 | 655f | 5f39 | 7061 | 7261 | 6d65 | 7465 |
| 3546320 | 723a | 2830 | 2c39 | 3529 | 2c33 | 3532 | 2c31 | 3238 | 3b3b | 0070 | 6172 | 616d | 6574 | 6572 | 3a5a | 6370 | 6172 | 616d | 6574 | 6572 | 3b4e | 4f62 | 6a65 | 6374 |
| 3546400 | 3b5f | 5f63 | 745f | 5f39 | 7061 | 7261 | 6d65 | 7465 | 7246 | 7620 | 5f5f | 6374 | 5f5f | 3970 | 6172 | 616d | 6574 | 6572 | 4652 | 4339 | 7061 | 7261 | 6d65 | 7465 |
| 3546460 | 7220 | 5f5f | 6474 | 5f5f | 3970 | 6172 | 616d | 6574 | 6572 | 4676 | 2067 | 6574 | 5f70 | 6172 | 616d | 6574 | 6572 | 5f6d | 6f64 | 655f | 5f39 | 7061 | 7261 | 6d65 |
| 3546540 | 7465 | 7246 | 7620 | 6765 | 745f | 7061 | 7261 | 6d65 | 7465 | 725f | 636c | 6173 | 735f | 5f39 | 7061 | 7261 | 6d65 | 7465 | 7246 | 7620 | 6765 | 745f | 7061 | 7261 |
| 3546620 | 5f73 | 6c6f | 775f | 5f39 | 7061 | 7261 | 6d65 | 7465 | 7246 | 7620 | 5c00 | 6765 | 745f | 7061 | 7261 | 5f73 | 6869 | 6768 | 5f5f | 3970 | 6172 | 616d | 6574 | 6572 |
| 3546700 | 4676 | 2067 | 6574 | 5f70 | 6172 | 616d | 6574 | 6572 | 5f72 | 616e | 6765 | 5f5f | 3970 | 6172 | 616d | 6574 | 6572 | 4676 | 2067 | 6574 | 5f70 | 6172 | 616d | 6574 |
| 3546760 | 6572 | 5f74 | 7970 | 655f | 5f39 | 7061 | 7261 | 6d65 | 7465 | 7246 | 7620 | 6765 | 745f | 7061 | 7261 | 6d65 | 7465 | 725f | 6e61 | 6d65 | 5f5f | 3970 | 6172 | 616d |
| 3547040 | 6574 | 6572 | 4676 | 2067 | 6574 | 5f70 | 6172 | 616d | 6574 | 6572 | 5f73 | 6c69 | 6365 | 5f5f | 3970 | 6172 | 616d | 6574 | 6572 | 4676 | 2067 | 6574 | 5f70 | 6172 |
| 3547120 | 616d | 6574 | 6572 | 5f50 | 5852 | 4546 | 5f5f | 3970 | 6172 | 616d | 6574 | 6572 | 4631 | 3050 | 6172 | 615f | 436c | 6173 | 7320 | 5c00 | 6765 | 745f | 636f | 7272 |
| 3547200 | 6563 | 745f | 6c65 | 6e67 | 7468 | 5f5f | 3970 | 6172 | 616d | 6574 | 6572 | 4676 | 2067 | 6574 | 5f70 | 6172 | 615f | 6c65 | 6e67 | 7468 | 5f5f | 3970 | 6172 | 616d |
| 3547260 | 6574 | 6572 | 4676 | 2067 | 6574 | 5f70 | 6172 | 615f | 7374 | 6174 | 7573 | 5f5f | 3970 | 6172 | 616d | 6574 | 6572 | 4676 | 2067 | 6574 | 5f70 | 6172 | 616d | 6574 |
| 3547340 | 6572 | 5f76 | 616c | 7565 | 5f5f | 3970 | 6172 | 616d | 6574 | 6572 | 4676 | 2067 | 6574 | 5f70 | 6172 | 616d | 6574 | 6572 | 5f76 | 616c | 7565 | 5f74 | 7970 | 655f |
| 3547420 | 5f39 | 7061 | 7261 | 6d65 | 7465 | 7246 | 7620 | 6765 | 745f | 7061 | 7261 | 6d65 | 7465 | 725f | 7376 | 616c | 7565 | 5f5f | 3970 | 6172 | 616d | 6574 | 6572 | 4676 |
| 3547500 | 205c | 0067 | 6574 | 5f70 | 6172 | 616d | 6574 | 6572 | 5f69 | 7661 | 6c75 | 655f | 5f39 | 7061 | 7261 | 6d65 | 7465 | 7246 | 7620 | 6765 | 745f | 7061 | 7261 | 6d65 |
| 3547560 | 7465 | 725f | 6676 | 616c | 7565 | 5f5f | 3970 | 6172 | 616d | 6574 | 6572 | 4676 | 2073 | 6574 | 5f70 | 6172 | 616d | 6574 | 6572 | 5f6e | 616d | 655f | 5f39 | 7061 |
| 3547640 | 7261 | 6d65 | 7465 | 7246 | 5063 | 2073 | 6574 | 5f70 | 6172 | 616d | 6574 | 6572 | 5f63 | 6c61 | 7373 | 5f5f | 3970 | 6172 | 616d | 6574 | 6572 | 4631 | 3050 | 6172 |
| 3547720 | 615f | 436c | 6173 | 7320 | 7365 | 745f | 7061 | 7261 | 6d65 | 7465 | 725f | 7479 | 7065 | 5f5f | 3970 | 6172 | 616d | 6574 | 6572 | 4650 | 6320 | 7365 | 745f | 7061 |
| 3550000 | 7261 | 6d65 | 7465 | 725f | 736c | 6963 | 655f | 5f39 | 7061 | 7261 | 6d65 | 7465 | 7246 | 5063 | 205c | 0073 | 6574 | 5f70 | 6172 | 616d | 6574 | 6572 | 5f73 | 7261 |
| 3550060 | 6e67 | 655f | 5f39 | 7061 | 7261 | 6d65 | 7465 | 7246 | 5063 | 2073 | 6574 | 5f70 | 6172 | 616d | 6574 | 6572 | 5f50 | 5852 | 6566 | 5f5f | 3970 | 6172 | 616d | 6574 |
| 3550140 | 6572 | 4650 | 6350 | 3562 | 6c6f | 636b | 2073 | 6574 | 5f70 | 6172 | 616d | 6574 | 6572 | 5f72 | 616e | 6765 | 5f5f | 3970 | 6172 | 616d | 6574 | 6572 | 4650 | 6320 |
| 3550220 | 7365 | 745f | 7061 | 7261 | 6d65 | 7465 | 725f | 6d6f | 6465 | 5f5f | 3970 | 6172 | 616d | 6574 | 6572 | 4650 | 6320 | 7365 | 745f | 7061 | 7261 | 6d65 | 7465 | 725f |
| 3550300 | 7661 | 6c75 | 655f | 5f39 | 7061 | 7261 | 6d65 | 7465 | 7246 | 5063 | 2073 | 6574 | 5f70 | 6172 | 616d | 6574 | 6572 | 5f76 | 616c | 7565 | 5f5f | 3970 | 6172 | 616d |
| 3550360 | 6574 | 6572 | 4669 | 295c | 0073 | 6574 | 5f70 | 6172 | 6161 | 6574 | 6572 | 5f76 | 616c | 7565 | 5f5f | 3970 | 6172 | 616d | 6574 | 6572 | 4666 | 2073 | 6574 | 5f70 |
| 3550440 | 6172 | 616d | 6574 | 6572 | 5f76 | 616c | 7565 | 5f74 | 7970 | 655f | 5f39 | 7061 | 7261 | 6d65 | 7465 | 7246 | 5063 | 2067 | 6574 | 5f56 | 4844 | 4c5f | 466f | 726d |
| 3550520 | 616c | 5f50 | 6172 | 616d | 5f5f | 3970 | 6172 | 616d | 6574 | 6572 | 4650 | 6369 | 2067 | 6574 | 5f56 | 4844 | 4c5f | 5072 | 6d74 | 725f | 5f39 | 7061 | 7261 | 6d65 |
| 3550600 | 7465 | 7246 | 5063 | 6920 | 6765 | 745f | 5648 | 444c | 5f45 | 7870 | 616e | 6465 | 645f | 466f | 726d | 616c | 5f50 | 6172 | 616d | 5f5f | 3970 | 6172 | 616d | 6574 |
| 3550660 | 6572 | 4650 | 3562 | 6c6f | 636b | 5063 | 6920 | 5c00 | 6765 | 745f | 5648 | 444c | 5f45 | 7870 | 616e | 6465 | 645f | 5072 | 6d74 | 725f | 4d61 | 705f | 5f39 | 7061 |
| 3550740 | 7261 | 6d65 | 7465 | 7246 | 5035 | 626c | 6f63 | 6b50 | 6369 | 2065 | 7870 | 6c61 | 696e | 5f5f | 3970 | 6172 | 616d | 6574 | 6572 | 4650 | 6320 | 3b3b | 3b00 | 5f5f |
| 3551020 | 7074 | 626c | 5f5f | 3970 | 6172 | 616d | 6574 | 6572 | 5f5f | 4d75 | 785f | 6378 | 783a | 4728 | 302c | 3333 | 2900 | 626c | 6f63 | 6b5f | 6174 | 7472 | 6962 | 7574 |
| 3551100 | 6573 | 3a54 | 2830 | 2c39 | 3829 | 3d73 | 3238 | 5f5f | 7670 | 7472 | 5f5f | 364f | 626a | 6563 | 743a | 2830 | 2c33 | 3329 | 2c30 | 2c33 | 323b | 6e61 | 6d65 | 5f5f |
| 3551160 | 374e | 4f62 | 6a65 | 6374 | 3a28 | 302c | 3230 | 292c | 3332 | 2c33 | 323b | 6e61 | 6d65 | 5f5f | 3136 | 626c | 6f63 | 6b5f | 6174 | 7472 | 6962 | 7574 | 6573 | 3a28 |
| 3551240 | 302c | 3230 | 292c | 3634 | 2c33 | 323b | 7661 | 6c75 | 655f | 5f31 | 3662 | 6c6f | 636b | 5f61 | 7474 | 7269 | 6275 | 7465 | 733a | 2830 | 2c39 | 3529 | 2c39 | 362c |

| | | | | | | | | | | | | | | | | | | | | | | | | |
|---|---|---|---|---|---|---|---|---|---|---|---|---|---|---|---|---|---|---|---|---|---|---|---|---|
| 3551320 | 3132 303b | 3b00 | 626c | 6f63 | 6b5f | 6174 | 7472 | 6962 | 7574 | 6573 | 3a5a | 6362 | 6c6f | 636b | 5f61 | 7474 | 7269 | 6275 | 7465 | 733b | 4e4f | 626a | 6563 | |
| 3551400 | 743b | 5f5f | 6374 | 5f5f | 3136 | 626c | 6f63 | 6b5f | 6174 | 7472 | 6962 | 7574 | 6573 | 4650 | 6320 | 5f5f | 6374 | 5f5f | 3136 | 626c | 6f63 | 6b5f | 6174 | 7472 |
| 3551460 | 6962 | 7574 | 6573 | 4676 | 205f | 5f63 | 745f | 5f31 | 3662 | 6c6f | 636b | 5f61 | 7474 | 7269 | 6275 | 7465 | 7346 | 5243 | 3136 | 626c | 6f63 | 6b5f | 6174 | 7472 |
| 3551540 | 6962 | 7574 | 6573 | 205f | 5f64 | 745f | 5f31 | 3662 | 6c6f | 636b | 5f61 | 7474 | 7269 | 6275 | 7465 | 7346 | 7620 | 7365 | 745f | 6174 | 7472 | 6962 | 7574 | 655f |
| 3551620 | 6e61 | 6d65 | 5f5f | 3136 | 626c | 6f63 | 6b5f | 6174 | 7472 | 6962 | 7574 | 6573 | 4650 | 6320 | 5c00 | 7365 | 745f | 6174 | 7472 | 6962 | 7574 | 655f | 7661 | 6c75 |
| 3551700 | 655f | 5f31 | 3662 | 6c6f | 636b | 5f61 | 7474 | 7269 | 6275 | 7465 | 7346 | 5063 | 2073 | 6574 | 5f61 | 7474 | 7269 | 6275 | 7465 | 5f76 | 616c | 7565 | 5f5f | 3136 |
| 3551760 | 626c | 6f63 | 6b5f | 6174 | 7472 | 6962 | 7574 | 6573 | 4669 | 2073 | 6574 | 5f61 | 7474 | 7269 | 6275 | 7465 | 5f76 | 616c | 7565 | 5f5f | 3136 | 626c | 6f63 | 6b5f |
| 3552040 | 6174 | 7472 | 6962 | 7574 | 6573 | 4666 | 2073 | 6574 | 5f61 | 7474 | 7269 | 6275 | 7465 | 5f74 | 7970 | 655f | 5f31 | 3662 | 6c6f | 636b | 5f61 | 7474 | 7269 | 6275 |
| 3552120 | 7465 | 7346 | 5063 | 2067 | 6574 | 5f61 | 7474 | 7269 | 6275 | 7465 | 5f6e | 616d | 655f | 5f31 | 3662 | 6c6f | 636b | 5f61 | 7474 | 7269 | 6275 | 7465 | 7346 | 7620 |
| 3552200 | 5c00 | 6765 | 745f | 6174 | 7472 | 6962 | 7574 | 655f | 7479 | 7065 | 5f5f | 3136 | 626c | 6f63 | 6b5f | 6174 | 7472 | 6962 | 7574 | 6573 | 4676 | 2067 | 6574 | 5f61 |
| 3552260 | 7474 | 7269 | 6275 | 7465 | 5f73 | 7661 | 6c75 | 655f | 5f31 | 3662 | 6c6f | 636b | 5f61 | 7474 | 7269 | 6275 | 7465 | 7346 | 7620 | 6765 | 745f | 6174 | 7472 | 6962 |
| 3552340 | 7574 | 655f | 6976 | 616c | 7565 | 5f5f | 3136 | 626c | 6f63 | 6b5f | 6174 | 7472 | 6962 | 7574 | 6573 | 4676 | 2067 | 6574 | 5f61 | 7474 | 7269 | 6275 | 7465 | 5f66 |
| 3552420 | 7661 | 6c75 | 655f | 5f31 | 3662 | 6c6f | 636b | 5f61 | 7474 | 7269 | 6275 | 7465 | 7346 | 7620 | 6765 | 745f | 6174 | 7472 | 6962 | 7574 | 655f | 7661 | 6c75 | 655f |
| 3552500 | 5f31 | 3662 | 6c6f | 636b | 5f61 | 7474 | 7269 | 6275 | 7465 | 7346 | 7620 | 5c00 | 6578 | 706c | 6169 | 6e5f | 5f31 | 3662 | 6c6f | 636b | 5f61 | 7474 | 7269 | 6275 |
| 3552560 | 7465 | 7346 | 5063 | 203b | 3b3b | 005f | 5f70 | 7462 | 6c5f | 5f31 | 3662 | 6c6f | 636b | 5f61 | 7474 | 7269 | 6275 | 7465 | 735f | 5f4d | 7578 | 5f63 | 7878 | 3a47 |
| 3552640 | 2830 | 2c33 | 3329 | 0065 | 6e74 | 6974 | 793a | 5428 | 302c | 3939 | 293d | 7336 | 305f | 5f76 | 7074 | 725f | 5f36 | 4f62 | 6a65 | 6374 | 3a28 | 302c | 3333 | 292c |
| 3552720 | 302c | 3332 | 3b6e | 616d | 655f | 5f37 | 4e4f | 626a | 6563 | 743a | 2830 | 2c32 | 3029 | 2c33 | 322c | 3332 | 3b6e | 616d | 655f | 5f36 | 656e | 7469 | 7479 | 3a28 |
| 3553000 | 302c | 3230 | 292c | 3634 | 2c33 | 323b | 4669 | 6c65 | 4e61 | 6d65 | 5f5f | 3665 | 6e74 | 6974 | 793a | 2830 | 2c32 | 3029 | 2c39 | 362c | 3332 | 3b61 | 7263 | 686e |
| 3553060 | 616d | 655f | 5f36 | 656e | 7469 | 7479 | 3a28 | 302c | 3230 | 292c | 3132 | 382c | 3332 | 3b74 | 7970 | 655f | 5f36 | 656e | 7469 | 7479 | 3a28 | 302c | 3129 | 2c31 |
| 3553140 | 3630 | 2c33 | 323b | 6172 | 6368 | 5f6c | 696e | 655f | 5f36 | 656e | 7469 | 7479 | 3a28 | 302c | 3129 | 2c31 | 3932 | 2c33 | 323b | 6361 | 6c6c | 5f6c | 696e | 655f |
| 3553220 | 5f36 | 656e | 7469 | 7479 | 3a28 | 302c | 3129 | 2c32 | 3234 | 2c33 | 323b | 5c00 | 7072 | 6373 | 5f6c | 696e | 655f | 5f36 | 656e | 7469 | 7479 | 3a28 | 302c | 3129 |
| 3553300 | 2c32 | 3536 | 2c33 | 323b | 7175 | 616c | 6966 | 6965 | 645f | 5f36 | 656e | 7469 | 7479 | 3a28 | 302c | 3838 | 292c | 3238 | 382c | 3936 | 3b73 | 7562 | 5f62 | 6c6f |
| 3553360 | 636b | 735f | 5f36 | 656e | 7469 | 7479 | 3a28 | 302c | 3838 | 292c | 3338 | 342c | 3936 | 3b3b | 0065 | 6e74 | 6974 | 793a | 5a63 | 656e | 7469 | 7479 | 3b4e | 4f62 |
| 3553440 | 6a65 | 6374 | 3b5f | 5f63 | 745f | 5f36 | 656e | 7469 | 7479 | 4676 | 205f | 5f63 | 745f | 5f36 | 656e | 7469 | 7479 | 4652 | 4336 | 656e | 7469 | 7479 | 205f | 5f64 |
| 3553520 | 745f | 5f36 | 656e | 7469 | 7479 | 4676 | 2073 | 6574 | 5f65 | 6e74 | 6974 | 795f | 6e61 | 6d65 | 5f5f | 3665 | 6e74 | 6974 | 7946 | 5063 | 2073 | 6574 | 5f65 | 6e74 |
| 3553600 | 6974 | 795f | 6669 | 6c65 | 5f5f | 3665 | 6e74 | 6974 | 7946 | 5063 | 2073 | 6574 | 5f65 | 6e74 | 6974 | 795f | 6172 | 6368 | 6e61 | 6d65 | 5f5f | 3665 | 6e74 | 6974 |
| 3553660 | 7946 | 5063 | 2073 | 6574 | 5f65 | 6e74 | 6974 | 795f | 7479 | 7065 | 5f5f | 3665 | 6e74 | 6974 | 7946 | 5063 | 205c | 0073 | 6574 | 5f61 | 7263 | 685f | 6c69 | 6e65 |
| 3553740 | 5f5f | 3665 | 6e74 | 6974 | 7946 | 6920 | 7365 | 745f | 6361 | 6c6c | 5f6c | 696e | 655f | 5f36 | 656e | 7469 | 7479 | 4669 | 2073 | 6574 | 5f70 | 7263 | 735f | 6c69 |
| 3554020 | 6e65 | 5f5f | 3665 | 6e74 | 6974 | 7946 | 6920 | 6765 | 745f | 656e | 7469 | 7479 | 5f6e | 616d | 655f | 5f36 | 656e | 7469 | 7479 | 4676 | 2067 | 6574 | 5f65 | 6e74 |
| 3554100 | 6974 | 795f | 6172 | 6368 | 6e61 | 6d65 | 5f5f | 3665 | 6e74 | 6974 | 7946 | 7620 | 6765 | 745f | 656e | 7469 | 7479 | 5f66 | 696c | 655f | 5f36 | 656e | 7469 | 7479 |
| 3554160 | 4676 | 2067 | 6574 | 5f65 | 6e74 | 6974 | 795f | 7479 | 7065 | 5f5f | 3665 | 6e74 | 6974 | 7946 | 7620 | 5c00 | 6765 | 745f | 6172 | 6368 | 5f6c | 696e | 655f | 5f36 |
| 3554240 | 656e | 7469 | 7479 | 4676 | 2067 | 6574 | 5f63 | 616c | 6c5f | 6c69 | 6e65 | 5f5f | 3665 | 6e74 | 6974 | 7946 | 7620 | 6765 | 745f | 7072 | 6373 | 5f6c | 696e | 655f |
| 3554320 | 5f36 | 656e | 7469 | 7479 | 4676 | 2069 | 7347 | 5445 | 5f5f | 3665 | 6e74 | 6974 | 7946 | 5036 | 4f62 | 6a65 | 6374 | 2069 | 734c | 5445 | 5f5f | 3665 | 6e74 | 6974 |
| 3554400 | 7946 | 5036 | 4f62 | 6a65 | 6374 | 2065 | 7870 | 6c61 | 696e | 5f5f | 3665 | 6e74 | 6974 | 7946 | 5063 | 203b | 3b3b | 005f | 5f70 | 7462 | 6c5f | 5f36 | 656e | 7469 |
| 3554460 | 7479 | 5f5f | 4d75 | 785f | 6378 | 783a | 4728 | 302c | 3333 | 2900 | 626c | 6f63 | 6b3a | 5428 | 302c | 3130 | 3029 | 3d73 | 3134 | 305f | 5f76 | 7074 | 725f | 5f36 |
| 3554540 | 4f62 | 6a65 | 6374 | 3a28 | 302c | 3333 | 292c | 302c | 3332 | 3b6e | 616d | 655f | 5f37 | 4e4f | 626a | 6563 | 743a | 2830 | 2c32 | 3029 | 2c33 | 322c | 3332 | 3b6e |
| 3554620 | 616d | 655f | 5f35 | 626c | 6f63 | 6b3a | 2830 | 2c32 | 3029 | 2c36 | 342c | 3332 | 3b74 | 7970 | 655f | 5f35 | 626c | 6f63 | 6b3a | 2830 | 2c31 | 292c | 3936 | 2c33 |
| 3554700 | 323b | 4d47 | 5f4e | 616d | 655f | 5f35 | 626c | 6f63 | 6b3a | 2830 | 2c32 | 3029 | 2c31 | 3238 | 2c33 | 323b | 4d47 | 5f54 | 7970 | 655f | 5f35 | 626c | 6f63 | 6b3a |
| 3554760 | 2830 | 2c32 | 3029 | 2c31 | 3630 | 2c33 | 323b | 4d47 | 5f53 | 7562 | 5479 | 7065 | 5f5f | 3562 | 6c6f | 636b | 3a28 | 302c | 3230 | 292c | 3139 | 322c | 3332 | 3b50 |
| 3555040 | 6172 | 656e | 745f | 5f35 | 626c | 6f63 | 6b3a | 2830 | 2c39 | 3929 | 2c32 | 3234 | 2c34 | 3830 | 3b5c | 004d | 4744 | 7363 | 7270 | 746e | 5f5f | 3562 | 6c6f | 636b |
| 3555120 | 3a28 | 302c | 3130 | 3129 | 3d2a | 2830 | 2c39 | 3229 | 2c37 | 3034 | 2c33 | 323b | 4163 | 7475 | 616c | 5f5f | 3562 | 6c6f | 636b | 3a28 | 302c | 3838 | 292c | 3733 |
| 3555200 | 362c | 3936 | 3b46 | 6f72 | 6d61 | 6c5f | 5f35 | 626c | 6f63 | 6b3a | 2830 | 2c38 | 3829 | 2c38 | 3332 | 2c39 | 363b | 5265 | 736f | 6c76 | 6564 | 5f5f | 3562 | 6c6f |
| 3555260 | 636b | 3a28 | 302c | 3838 | 292c | 3932 | 382c | 3936 | 3b41 | 7474 | 7269 | 6275 | 7465 | 735f | 5f35 | 626c | 6f63 | 6b3a | 2830 | 2c38 | 3829 | 2c31 | 3032 | 342c |
| 3555340 | 3936 | 3b3b | 0062 | 6c6f | 636b | 3a5a | 6362 | 6c6f | 636b | 3b4e | 4f62 | 6a65 | 6374 | 3b5f | 5f63 | 745f | 5f35 | 626c | 6f63 | 6b46 | 7620 | 5f5f | 6374 | 5f5f |
| 3555420 | 3562 | 6c6f | 636b | 4652 | 4335 | 626c | 6f63 | 6b20 | 5f5f | 6474 | 5f5f | 3562 | 6c6f | 636b | 4676 | 2073 | 6574 | 5f62 | 6c6f | 636b | 5f6e | 616d | 655f | 5f35 |
| 3555500 | 626c | 6f63 | 6b46 | 5063 | 2073 | 6574 | 5f62 | 6c6f | 636b | 5f74 | 7970 | 655f | 5f35 | 626c | 6f63 | 6b46 | 5063 | 2067 | 6574 | 5f62 | 6c6f | 636b | 5f6e | 616d |
| 3555560 | 655f | 5f35 | 626c | 6f63 | 6b46 | 7620 | 6765 | 745f | 626c | 6f63 | 6b5f | 7479 | 7065 | 5f5f | 3562 | 6c6f | 636b | 4676 | 2067 | 6574 | 5f62 | 6c6f | 636b | 5f70 |
| 3555640 | 6172 | 656e | 745f | 5f35 | 626c | 6f63 | 6b46 | 7620 | 5c00 | 6765 | 745f | 626c | 6f63 | 6b5f | 4d6f | 6447 | 656e | 5f5f | 3562 | 6c6f | 636b | 4676 | 2067 | 6574 |
| 3555720 | 5f46 | 6f72 | 6d61 | 6c5f | 5f35 | 626c | 6f63 | 6b46 | 7620 | 6765 | 745f | 4163 | 7475 | 616c | 5f5f | 3562 | 6c6f | 636b | 4676 | 2067 | 6574 | 5f52 | 6573 | 6f6c |
| 3556000 | 7665 | 645f | 5f35 | 626c | 6f63 | 6b46 | 7620 | 6765 | 745f | 4174 | 7472 | 6962 | 7574 | 655f | 5f35 | 626c | 6f63 | 6b46 | 7620 | 6765 | 745f | 636f | 6d70 | 5f6c |
| 3556060 | 656e | 6774 | 685f | 5f35 | 626c | 6f63 | 6b46 | 7620 | 6973 | 5175 | 616c | 6966 | 6965 | 645f | 5f35 | 626c | 6f63 | 6b46 | 7620 | 6973 | 4c54 | 455f | 5f35 | 626c |
| 3556140 | 6f63 | 6b46 | 5036 | 4f62 | 6a65 | 6374 | 205c | 0069 | 7347 | 5445 | 5f5f | 3562 | 6c6f | 636b | 4650 | 364f | 626a | 6563 | 7420 | 6578 | 706c | 6169 | 6e5f | 5f35 |
| 3556220 | 626c | 6f63 | 6b46 | 5063 | 2052 | 6576 | 6572 | 7365 | 416c | 6c4c | 6973 | 7473 | 5f5f | 3562 | 6c6f | 636b | 4676 | 2043 | 6065 | 636b | 5061 | 7261 | 4c69 | 7374 |
| 3556300 | 735f | 5f35 | 626c | 6f63 | 6b46 | 7620 | 4368 | 6563 | 6b50 | 6172 | 616d | 4c69 | 7374 | 5f5f | 3562 | 6c6f | 636b | 4650 | 3550 | 4c69 | 7374 | 2057 | 5f56 | 4844 |
| 3556360 | 4c5f | 436f | 6d70 | 496e | 7374 | 5f5f | 3562 | 6c6f | 636b | 4676 | 2057 | 5f56 | 4844 | 4c5f | 436f | 6d70 | 4465 | 635f | 5f35 | 626c | 6f63 | 6b46 | 7620 | 6765 |

| | | | | | | | | | | | | | | | | | | | | | | | | |
|---|---|---|---|---|---|---|---|---|---|---|---|---|---|---|---|---|---|---|---|---|---|---|---|---|
| 3556440 | 745f | 5648 | 444c | 5f43 | 6f6d | 704c | 6162 | 6c65 | 5f5f | 3562 | 6c6f | 636b | 4650 | 6320 | 5c00 | 6765 | 745f | 5648 | 444c | 5f43 | 6f6d | 704e | 616d | 655f |
| 3556520 | 5f35 | 626c | 6f63 | 6b46 | 5063 | 2057 | 5f4d | 475f | 436f | 6d70 | 4473 | 6372 | 7074 | 6e5f | 5f35 | 626c | 6f63 | 6b46 | 7620 | 575f | 4d47 | 5f43 | 6865 | 636b |
| 3556600 | 436f | 6d70 | 5f5f | 3562 | 6c6f | 636b | 4676 | 2057 | 5f43 | 4c5f | 4172 | 6368 | 426f | 6479 | 5f5f | 3562 | 6c6f | 636b | 4676 | 2057 | 5f43 | 4c5f | 456e | 7469 |
| 3556660 | 7479 | 4465 | 635f | 5f35 | 626c | 6f63 | 6b46 | 7620 | 3b3b | 3b00 | 5f5f | 7074 | 626c | 5f5f | 3562 | 6c6f | 636b | 5f5f | 4d75 | 785f | 6378 | 783a | 4728 | 302c |
| 3556740 | 3333 | 2900 | 5f5f | 6374 | 5f5f | 3665 | 6e74 | 6974 | 7946 | 763a | 6628 | 302c | 3130 | 3229 | 3d2a | 2830 | 2c39 | 3929 | 005f | 5f30 | 7468 | 6973 | 3a70 | 2830 |
| 3557020 | 2c31 | 3032 | 2900 | 2f68 | 6f6d | 652f | 6f73 | 6173 | 312f | 612f | 6162 | 2f73 | 7263 | 2f6e | 6577 | 6f62 | 6a65 | 6374 | 732f | 7072 | 6f67 | 2f68 | 7878 | 2f65 |
| 3557100 | 6e74 | 6974 | 792e | 6978 | 7800 | 5f5f | 3074 | 6869 | 733a | 7228 | 302c | 3130 | 3229 | 005f | 5f30 | 7468 | 6973 | 203a | 5a74 | 6c00 | 5f5f | 6374 | 5f5f | 3665 |
| 3557160 | 6e74 | 6974 | 7946 | 7620 | 3a5a | 7446 | 0044 | 6573 | 6967 | 6e55 | 6e69 | 743a | 5428 | 302c | 3130 | 3329 | 3d73 | 3532 | 5f5f | 7670 | 7472 | 5f5f | 364f | 626a |
| 3557240 | 6563 | 743a | 2830 | 2c33 | 3329 | 2c30 | 2c33 | 323b | 6e61 | 6d65 | 5f5f | 374e | 4f62 | 6a65 | 6374 | 3a28 | 302c | 3230 | 292c | 3332 | 2c33 | 323b | 4465 | 556e |
| 3557320 | 4e61 | 6d65 | 5f5f | 3130 | 4465 | 7369 | 676e | 556e | 6974 | 3a28 | 302c | 3230 | 292c | 3634 | 2c33 | 323b | 4669 | 6c65 | 4e61 | 6d65 | 5f5f | 3130 | 4465 | 7369 |
| 3557400 | 676e | 556e | 6974 | 3a28 | 302c | 3230 | 292c | 3936 | 2c33 | 323b | 4172 | 6369 | 4e61 | 6d65 | 5f5f | 3130 | 4465 | 7369 | 676e | 556e | 6974 | 3a28 | 302c | 3230 |
| 3557460 | 292c | 3132 | 382c | 3332 | 3b44 | 6555 | 6e54 | 7970 | 655f | 5f31 | 3044 | 6573 | 6967 | 6e55 | 6e69 | 743a | 2830 | 2c31 | 292c | 3136 | 302c | 3332 | 3b41 | 7263 |
| 3557540 | 684c | 696e | 655f | 5f31 | 3044 | 6573 | 6967 | 6e55 | 6e69 | 743a | 2830 | 2c31 | 292c | 3139 | 322c | 3332 | 3b51 | 7561 | 6c69 | 6669 | 6564 | 5f5f | 3130 | 4465 |
| 3557620 | 7369 | 676e | 556e | 6974 | 3a28 | 302c | 3838 | 292c | 3232 | 342c | 3936 | 3b53 | 7562 | 426c | 6f63 | 6b73 | 5f5f | 3130 | 4465 | 7369 | 676e | 556e | 6974 | 3a28 |
| 3557700 | 302c | 3838 | 292c | 3332 | 302c | 3936 | 3b3b | 0044 | 6573 | 6967 | 6e55 | 6e69 | 743a | 5a63 | 4465 | 7369 | 676e | 556e | 6974 | 3b4e | 4f62 | 6a65 | 6374 | 3b5f |
| 3557760 | 5f63 | 745f | 5f31 | 3044 | 6573 | 6967 | 6e55 | 6e69 | 7446 | 7620 | 5f5f | 6374 | 5f5f | 3130 | 4465 | 7369 | 676e | 556e | 6974 | 4650 | 6320 | 5f5f | 6374 | 5f5f |
| 3560040 | 3130 | 4465 | 7369 | 676e | 556e | 6974 | 4650 | 3665 | 6e74 | 6974 | 7920 | 5f5f | 6374 | 5f5f | 3130 | 4465 | 7369 | 676e | 556e | 6974 | 4652 | 4331 | 3044 | 6573 |
| 3560120 | 6967 | 6e55 | 6e69 | 7420 | 5f5f | 6474 | 5f5f | 3130 | 4465 | 7369 | 676e | 556e | 6974 | 4676 | 2073 | 6574 | 5f44 | 555f | 4465 | 556e | 4e61 | 6d65 | 5f5f | 3130 |
| 3560200 | 4465 | 7369 | 676e | 556e | 6974 | 4650 | 6320 | 5c00 | 7365 | 745f | 4455 | 5f46 | 696c | 654e | 616d | 655f | 5f31 | 3044 | 6573 | 6967 | 6e55 | 6e69 | 7446 | 5063 |
| 3560260 | 2073 | 6574 | 5f44 | 555f | 4172 | 6368 | 4e61 | 6d65 | 5f5f | 3130 | 4465 | 7369 | 676e | 556e | 6974 | 4650 | 6320 | 7365 | 745f | 4455 | 5f44 | 6555 | 6e54 | 7970 |
| 3560340 | 655f | 5f31 | 3044 | 6573 | 6967 | 6e55 | 6e69 | 7446 | 6920 | 7365 | 745f | 4455 | 5f41 | 7263 | 684c | 696e | 655f | 5f31 | 3044 | 6573 | 6967 | 6e55 | 6e69 | 7446 |
| 3560420 | 6920 | 6765 | 745f | 4455 | 5f46 | 696c | 654e | 616d | 655f | 5f31 | 3044 | 6573 | 6967 | 6e55 | 6e69 | 7446 | 7620 | 4571 | 7561 | 6c5f | 5f31 | 3044 | 6573 | 6967 |
| 3560500 | 6e55 | 6e69 | 7446 | 5036 | 656e | 7469 | 7479 | 205c | 0069 | 7347 | 5445 | 5f5f | 3130 | 4465 | 7369 | 676e | 556e | 6974 | 4650 | 364f | 626a | 6563 | 7420 | 6973 |
| 3560560 | 4c54 | 455f | 5f31 | 3044 | 6573 | 6967 | 6e55 | 6e69 | 7446 | 5036 | 4f62 | 6a65 | 6374 | 2067 | 6574 | 5f44 | 555f | 5175 | 616c | 6966 | 6965 | 645f | 5f31 | 3044 |
| 3560640 | 6573 | 6967 | 6e55 | 6e69 | 7446 | 7620 | 6765 | 745f | 4455 | 5f53 | 7562 | 426c | 6f63 | 6b73 | 5f5f | 3130 | 4465 | 7369 | 676e | 556e | 6974 | 4676 | 2045 | 7870 |
| 3560720 | 616e | 645f | 5648 | 444c | 5f44 | 555f | 5f31 | 3044 | 6573 | 6967 | 6e55 | 6e69 | 7446 | 7620 | 6578 | 706c | 6169 | 6e5f | 5f31 | 3044 | 6573 | 6967 | 6e55 | 6e69 |
| 3561000 | 7446 | 5063 | 203b | 3b3b | 005f | 5f70 | 7462 | 6c5f | 5f31 | 3044 | 6573 | 6967 | 6e55 | 6e69 | 745f | 5f4d | 7578 | 5f63 | 7878 | 3a47 | 2830 | 2c33 | 3329 | 0046 |
| 3561060 | 696c | 6555 | 6e69 | 743a | 5428 | 302c | 3130 | 3429 | 3d73 | 3234 | 5f5f | 7670 | 7472 | 5f5f | 364f | 626a | 6563 | 743a | 2830 | 2c33 | 3329 | 2c30 | 2c33 | 323b |
| 3561140 | 6e61 | 6d65 | 5f5f | 374e | 4f62 | 6a65 | 6374 | 3a28 | 302c | 3230 | 292c | 3332 | 2c33 | 323b | 4669 | 6c65 | 4e61 | 6d65 | 5f5f | 3846 | 696c | 6555 | 6e69 | 743a |
| 3561220 | 2830 | 2c32 | 3029 | 2c36 | 342c | 3332 | 3b45 | 6e74 | 6974 | 794c | 6973 | 745f | 5f38 | 4669 | 6c65 | 556e | 6974 | 3a28 | 302c | 3838 | 292c | 3936 | 2c39 | 363b |
| 3561300 | 3b00 | 4669 | 6c65 | 556e | 6974 | 3a5a | 6346 | 696c | 6555 | 6e69 | 743b | 4e4f | 626a | 6563 | 743b | 5f5f | 6374 | 5f5f | 3846 | 696c | 6555 | 6e69 | 7446 | 7620 |
| 3561360 | 5f5f | 6374 | 5f5f | 3846 | 696c | 6555 | 6e69 | 7446 | 5063 | 205f | 5f63 | 745f | 5f38 | 4669 | 6c65 | 556e | 6974 | 4652 | 4338 | 4669 | 6c65 | 556e | 6974 | 205f |
| 3561440 | 5f64 | 745f | 5f38 | 4669 | 6c65 | 556e | 6974 | 4676 | 2073 | 6574 | 5f46 | 555f | 4669 | 6c65 | 4e61 | 6d65 | 5f5f | 3846 | 696c | 6555 | 6e69 | 7446 | 5063 | 2067 |
| 3561520 | 6574 | 5f46 | 555f | 4669 | 6c65 | 4e61 | 6165 | 5f5f | 3846 | 696c | 6555 | 6e69 | 7446 | 7620 | 6765 | 745f | 456e | 7469 | 7479 | 4c69 | 7374 | 5f5f | 3846 | 696c |
| 3561600 | 6555 | 6e69 | 7446 | 7620 | 5c00 | 4578 | 7061 | 6e64 | 5f56 | 4844 | 4c5f | 4455 | 5f5f | 3846 | 696c | 6555 | 6e69 | 7446 | 7620 | 6578 | 706c | 6169 | 6e5f | 5f38 |
| 3561660 | 4669 | 6c65 | 556e | 6974 | 4650 | 6320 | 3b3b | 3b00 | 5f5f | 7074 | 626c | 5f5f | 3846 | 696c | 6555 | 6e69 | 745f | 5f4d | 7578 | 5f63 | 7878 | 3a47 | 2830 | 2c33 |
| 3561740 | 3329 | 0041 | 6c6c | 426c | 6f63 | 6b73 | 3a54 | 2830 | 2c31 | 3035 | 293d | 7334 | 345f | 5f76 | 7074 | 725f | 5f36 | 4f62 | 6a65 | 6374 | 3a28 | 302c | 3333 | 292c |
| 3562020 | 302c | 3332 | 3b6e | 616d | 655f | 5f37 | 4e4f | 626a | 6563 | 743a | 2830 | 2c32 | 3029 | 2c33 | 322c | 3332 | 3b42 | 6c6f | 636b | 4c69 | 7374 | 5f5f | 3941 | 6c6c |
| 3562100 | 426c | 6f63 | 6b73 | 3a28 | 302c | 3838 | 292c | 3634 | 2c39 | 363b | 4455 | 4c69 | 7374 | 5f5f | 3941 | 6c6c | 426c | 6f63 | 6b73 | 3a28 | 302c | 3838 | 292c | 3136 |
| 3562160 | 302c | 3936 | 3b46 | 554c | 6973 | 745f | 5f39 | 416c | 6c42 | 6c6f | 636b | 733a | 2830 | 2c38 | 3829 | 2c32 | 3536 | 2c39 | 363b | 3b00 | 416c | 6c42 | 6c6f | 636b |
| 3562240 | 733a | 5a63 | 416c | 6c42 | 6c6f | 636b | 733b | 4e4f | 626a | 6563 | 743b | 5f5f | 6374 | 5f5f | 3941 | 6c6c | 426c | 6f63 | 6b73 | 4676 | 205f | 5f63 | 745f | 5f39 |
| 3562320 | 416c | 6c42 | 6c6f | 636b | 7346 | 5243 | 3941 | 6c6c | 426c | 6f63 | 6b73 | 205f | 5f64 | 745f | 5f39 | 416c | 6c42 | 6c6f | 636b | 7346 | 7620 | 6765 | 745f | 426c |
| 3562400 | 6f63 | 6b4c | 6973 | 745f | 5f39 | 416c | 6c42 | 6c6f | 636b | 7346 | 7620 | 6765 | 745f | 4455 | 4c69 | 7374 | 5f5f | 3941 | 6c6c | 426c | 6f63 | 6b73 | 4676 | 2067 |
| 3562460 | 6574 | 5f46 | 554c | 6973 | 745f | 5f39 | 416c | 6c42 | 6c6f | 636b | 7346 | 7620 | 5265 | 6164 | 5f56 | 4844 | 4c5f | 426c | 6b46 | 696c | 655f | 5f39 | 416c | 6c42 |
| 3562540 | 6c6f | 636b | 7346 | 5063 | 205c | 0052 | 6576 | 6572 | 7365 | 5061 | 7261 | 6d4c | 6973 | 7473 | 5f5f | 3941 | 6c6c | 426c | 6f63 | 6b73 | 4676 | 206d | 616b | 655f |
| 3562620 | 4455 | 4c69 | 7374 | 5f5f | 3941 | 6c6c | 426c | 6f63 | 6b73 | 4676 | 206d | 616b | 655f | 4655 | 4c69 | 7374 | 5f5f | 3941 | 6c6c | 426c | 6f63 | 6b73 | 4676 | 2045 |
| 3562700 | 7870 | 616e | 645f | 5648 | 444c | 5f46 | 555f | 5f39 | 416c | 6c42 | 6c6f | 636b | 7346 | 7620 | 6578 | 706c | 6169 | 6e5f | 5f39 | 416c | 6c42 | 6c6f | 636b | 7346 |
| 3562760 | 5063 | 203b | 3b3b | 005f | 5f70 | 7462 | 6c5f | 5f39 | 416c | 6c42 | 6c6f | 636b | 735f | 5f4d | 7578 | 5f63 | 7878 | 3a47 | 2830 | 2c33 | 3329 | 004d | 475f | 5370 |
| 3563040 | 6563 | 6966 | 6963 | 3a54 | 2830 | 2c31 | 3036 | 293d | 7331 | 3274 | 6563 | 686e | 6f6c | 6f67 | 795f | 5f31 | 314d | 475f | 5370 | 6563 | 6966 | 6963 | 3a28 | 302c |
| 3563120 | 3230 | 292c | 302c | 3332 | 3b6c | 6273 | 5f74 | 6563 | 684e | 756d | 5f5f | 3131 | 4d47 | 5f53 | 7065 | 6369 | 6669 | 633a | 2830 | 2c31 | 292c | 3332 | 2c33 | 323b |
| 3563200 | 4d65 | 6d5f | 7465 | 6368 | 4e75 | 6d5f | 5f31 | 314d | 475f | 5370 | 6563 | 6966 | 6963 | 3a28 | 302c | 3129 | 2c36 | 342c | 3332 | 3b3b | 004d | 475f | 5370 | 6563 |
| 3563260 | 6966 | 6963 | 3a5a | 634d | 475f | 5370 | 6563 | 6966 | 6963 | 3b3b | 5f5f | 6374 | 5f5f | 3131 | 4d47 | 5f53 | 7065 | 6369 | 6669 | 6346 | 7620 | 5f5f | 6474 | 5f5f |
| 3563340 | 3131 | 4d47 | 5f53 | 7065 | 6369 | 6669 | 6346 | 7620 | 7365 | 745f | 7465 | 6368 | 6e6f | 6c6f | 6779 | 5f6e | 616d | 655f | 5f31 | 314d | 475f | 5370 | 6563 | 6966 |
| 3563420 | 6963 | 4650 | 6320 | 6765 | 745f | 6c62 | 735f | 7465 | 6368 | 4e75 | 6d5f | 5f31 | 314d | 475f | 5370 | 6563 | 6966 | 6963 | 4676 | 2067 | 6574 | 5f4d | 656d | 5f74 |
| 3563500 | 6563 | 684e | 756d | 5f5f | 3131 | 4d47 | 5f53 | 7065 | 6369 | 6669 | 6346 | 7620 | 6765 | 745f | 7465 | 6368 | 4e61 | 6d65 | 5f5f | 3131 | 4d47 | 5f53 | 7065 | 6369 |

```
3563560 6669 6346 7620 5c00 6578 706c 6169 6e5f 5f31 314d 475f 5370 6563 6966 6963 4650 6320 3b3b 3b00 4475 783a 5428 302c 3130
3563640 3729 3373 3634 4269 7457 5964 7468 5f5f 364d 6f64 4765 6e3a 2830 2c31 292c 302c 3332 3b45 5374 6174 655f 5f36 4d6f 6447
3563720 656e 3a28 302c 3738 292c 3332 2c33 323b 5069 6e4e 616d 654c 656e 6774 685f 5f36 4d6f 6447 656e 3a28 302c 3838 292c 3634
3564000 2c39 363b 5f5f 7670 7472 5f5f 364d 6f64 4765 6e3a 2830 2c33 3329 2c31 3630 2c33 323b 7479 7065 5f5f 334d 7578 3a28 302c
3564060 3230 292c 3139 322c 3332 3b6d 6169 6e5f 6465 6e75 5f5f 334d 7578 3a28 302c 3129 2c32 3234 2c33 323b 7375 625f 6d65 6e75
3564140 5f5f 334d 7578 3a28 302c 3129 2c32 3536 2c33 323b 6d6f 6475 6c65 6e61 6d65 5f5f 334d 7578 3a28 302c 3230 292c 3238 382c
3564220 3332 3b5c 0062 6974 735f 5f33 4d75 783a 2830 2c31 292c 3332 302c 3332 3b47 6174 6564 4f50 5f5f 334d 7578 3a28 302c 3738
3564300 292c 3335 322c 3332 3b45 6e63 6f64 6564 534c 5f5f 334d 7578 3a28 302c 3738 292c 3338 342c 3332 3b46 6173 745f 5f33 4d75
3564360 783a 2830 2c37 3829 2c34 3136 2c33 323b 496e 764f 505f 5f33 4d75 783a 2830 2c37 3829 2c34 3438 2c33 323b 4869 4472 6976
3564440 655f 5f33 4d75 783a 2830 2c37 3829 2c34 3830 2c33 323b 3b00 4d75 783a 5a63 4d75 783b 4d6f 6447 656e 3b5f 5f63 745f 5f33
3564520 4d75 7846 5063 205f 5f63 745f 5f33 4d75 7846 7620 5f5f 6374 5f5f 334d 7578 4652 4333 4d75 7820 5f5f 6474 5f5f 334d 7578
3564600 4676 2073 6574 4e61 6d65 496e 6465 785f 5f33 4d75 7846 5063 2073 6574 496e 6465 785f 5f33 4d75 7846 7620 4c6f 6164 5f56
3564660 4844 4c5f 4461 7461 5f5f 334d 7578 4650 374e 4f62 6a65 6374 2043 6f6d 706f 7365 5f4d 6f64 4765 6e5f 4465 7363 7269 7074
3564740 6f72 5f5f 334d 7578 4650 6320 3b3b 3b00 5f5f 7074 626c 5f5f 334d 7578 5f5f 4d75 785f 6378 783a 4728 302c 3333 2900 7465
3565020 6d70 4d47 3a47 2830 2c32 3029 004d 473a 4728 302c 3130 3829 3d2a 2830 2c31 3036 2900 7365 7449 6e64 6578 5f5f 334d 7578
3565100 4676 3a46 2830 2c32 2900 5f5f 3074 6869 733a 7028 302c 3130 3929 3d2a 2830 2c31 3037 2900 4d75 782e 6378 7800 5f5f 3074
3565160 6869 7320 3a5a 746c 0073 6574 496e 6465 785f 5f33 4d75 7846 7620 3a5a 7446 004c 6f61 645f 5648 444c 5f44 6174 615f 5f33
3565240 4d75 7846 5037 4e4f 626a 6563 743a 4628 302c 3229 005f 5f30 7468 6973 3a70 2830 2c31 3039 2900 5f5f 304e 3a70 2830 2c38
3565320 3629 005f 5f30 7468 6973 3a72 2830 2c31 3039 2900 5f5f 3142 3a28 302c 3131 3029 3d2a 2830 2c31 3030 2900 5f5f 314e 756d
3565400 4f66 5061 7261 3a28 302c 3129 005f 5f30 5f5f 4b36 353a 2830 2c31 3131 293d 2a28 302c 3838 2900 5f5f 305f 5f4b 3636 3a28
3565460 302c 3131 3129 005f 5f30 5f5f 4b36 373a 2830 2c31 3131 2900 5f5f 305f 5f4b 3638 3a28 302c 3131 3129 005f 5f30 5f5f 5874
3565540 6869 7330 3071 776d 7a6f 653a 2830 2c39 3029 005f 5f30 5f5f 5942 3030 7969 6a30 6f65 3a28 302c 3738 2900 5f5f 305f 5f4b
3565620 3639 3a28 302c 3131 3129 005f 5f30 7468 6973 203a 5a74 6c00 5f5f 304e 203a 5a74 6c00 5f5f 3142 203a 5a74 6c00 5f5f 314e
3565700 756d 4f66 5061 7261 203a 5a74 6c00 5f5f 305f 5f4b 3635 203a 5a74 6c00 5f5f 305f 5f4b 3636 203a 5a74 6c00 5f5f 305f 5f4b
3565760 3637 203a 5a74 6c00 5f5f 305f 5f4b 3638 203a 5a74 6c00 5f5f 305f 5f58 7468 6973 3030 7177 6d7a 6f65 203a 5a74 6c00 5f5f
3566040 305f 5f4b 3639 203a 5a74 6c00 4c6f 6164 5f56 4844 4c5f 4461 7461 5f5f 334d 7578 4650 374e 4f62 6a65 6374 203a 5a74 4600
3566120 436f 6d70 6f73 655f 4d6f 6447 656e 5f44 6573 6372 6970 746f 725f 5f33 4d75 7846 5063 3a46 2830 2c32 3029 005f 5f30 7468
3566200 6973 3a70 2830 2c31 3039 2900 5f5f 3062 7566 663a 7028 302c 3230 2900 5f5f 3074 6869 733a 7228 302c 3130 3929 005f 5f30
3566260 7468 6973 203a 5a74 6c00 5f5f 3062 7566 6620 3a5a 746c 0043 6f6d 706f 7365 5f4d 6f64 4765 6e5f 4465 7363 7269 7074 6f72
3566340 5f5f 334d 7578 4650 6320 3a5a 7446 005f 5f73 7469 5f5f 4d75 785f 6378 785f 7365 7449 6e64 6578 5f3a 4628 302c 3229 002f
3566420 7573 722f 4343 2f73 756e 342f 696e 636c 2f69 6f73 7472 6561 6d2e 6800 5f5f 7374 645f 5f4d 7578 5f63 7878 5f73 6574 496e
3566500 6465 785f 3a46 2830 2c32 2900 5f5f 7674 626c 5f5f 334d 7578 3a47 2830 2c31 3132 293d 6172 2830 2c31 293b 303b 363b 2830
3566560 2c31 3529 005f 5f76 7462 6c5f 5f31 3662 6c6f 636b 5f61 7474 7269 6275 7465 735f 5f4d 7578 5f63 7878 3a47 2830 2c31 3133
3566640 293d 6172 2830 2c31 293b 303b 3130 3b28 302c 3135 2900 5f5f 7674 626c 5f5f 384c 504f 626a 6563 745f 5f4d 7578 5f63 7878
3566720 3a47 2830 2c31 3134 293d 6172 2830 2c31 293b 303b 333b 2830 2c31 3529 0073 6574 4e61 6d65 496e 6465 785f 5f33 4d75 7846
3567000 5063 3a66 2830 2c32 2900 5f5f 3074 6869 733a 7028 302c 3130 3929 005f 5f30 743a 7028 302c 3230 2900 2e2f 6878 782f 4d75
3567060 782e 6878 7800 5f5f 3074 6869 7320 3a5a 746c 005f 5f30 7420 3a5a 746c 0073 6574 4e61 6d65 496e 6465 785f 5f33 4d75 7846
3567140 5063 203a 5a74 4600 7365 745f 4655 5f46 696c 654e 616d 655f 5f38 4669 6c65 556e 6974 4650 633a 6628 302c 3229 005f 5f30
3567220 7468 6973 3a70 2830 2c31 3135 293d 2a28 302c 3130 3429 005f 5f30 733a 7028 302c 3230 2900 2f68 6f6d 652f 6f73 6173 312f
3567300 612f 6162 2f73 7263 2f6e 6577 6f62 6a65 6374 732f 7072 6f67 2f68 7878 2f46 696c 6555 6e2e 6878 7800 5f5f 3074 6869 733a
3567360 7228 302c 3131 3529 005f 5f30 7468 6973 203a 5a74 6c00 5f5f 3073 203a 5a74 6c00 7365 745f 4655 5f46 696c 654e 616d 655f
3567440 5f38 4669 6c65 556e 6974 4650 6320 3a5a 7446 0065 7870 6c61 696e 5f5f 3136 626c 6f63 6b5f 6174 7472 6962 7574 6573 4650
3567520 633a 6628 302c 3229 005f 5f30 7468 6973 3a70 2830 2c31 3136 293d 2a28 302c 3938 2900 5f5f 3073 3a70 2830 2c32 3029 002f
3567600 686f 6d65 2f6f 7361 7331 2f61 2f61 622f 7372 632f 6e65 776f 626a 6563 7473 2f70 726f 672f 6878 782f 6174 7472 6962 7574
3567660 652e 6878 7800 5f5f 3074 6869 733a 7228 302c 3131 3629 005f 5f30 7468 6973 203a 5a74 6c00 5f5f 3073 203a 5a74 6c00 6578
3567740 706c 6169 6e5f 5f31 3662 6c6f 636b 5f61 7474 7269 6275 7465 7346 5063 203a 5a74 4600 7365 745f 7061 7261 6d65 7465 725f
3570020 7661 6c75 655f 7479 7065 5f5f 3970 6172 6164 6574 6572 4650 633a 6628 302c 3229 005f 5f30 7468 6973 3a70 2830 2c39 3729
3570100 005f 5f30 733a 7028 302c 3230 2900 2f68 6f6d 652f 6f73 6173 312f 612f 6162 2f73 7263 2f6e 6577 6f62 6a65 6374 732f 7072
3570160 6f67 2f68 7878 2f70 6172 616d 6574 6572 2e68 7878 005f 5f30 7468 6973 3a72 2830 2c39 3729 005f 5f30 7468 6973 203a 5a74
3570240 6c00 5f5f 3073 203a 5a74 6c00 7365 745f 7061 7261 6d65 7465 725f 7661 6c75 655f 7479 7065 5f5f 3970 6172 616d 6574 6572
3570320 4650 6320 3a5a 7446 0065 7870 6c61 696e 5f5f 384c 504f 626a 6563 7446 5063 3a66 2830 2c32 2900 5f5f 3074 6869 733a 7028
3570400 302c 3131 3729 342a 2830 2c38 3529 005f 5f30 733a 7028 302c 3230 2900 2f68 6f6d 652f 6f73 6173 312f 612f 6162 2f73 7263
3570460 2f6e 6577 6f62 6a65 6374 732f 6878 782f 4c50 4f62 6a65 6374 5f64 622e 6878 7800 5f5f 3074 6869 733a 7228 302c 3131 3729
3570540 005f 5f30 7468 6973 203a 5a74 6c00 5f5f 3073 203a 5a74 6c00 6578 706c 6169 6e5f 5f38 4c50 4f62 6a65 6374 4650 6320 3a5a
3570620 7446 0069 734c 5445 5f5f 374e 4f62 6a65 6374 4650 364f 626a 6563 743a 6628 302c 3129 005f 5f30 7468 6973 3a70 2830 2c38
```

```
3570700 3629 005f 5f30 5f5f 4133 393a 7028 302c 3131 3829 342a 2830 2c37 3929 002f 686f 6d65 2f6f 7361 7331 2f61 2f61 622f 7372
3570760 632f 6e65 776f 626a 6563 7473 2f68 7878 2f4e 4f62 6a65 6374 5f64 622e 6878 7800 5f5f 3074 6869 7320 3a5a 746c 005f 5f30
3571040 5f5f 4133 3920 3a5a 746c 0069 734c 5445 5f5f 374e 4f62 6a65 6374 4650 364f 626a 6563 7420 3a5a 7446 0069 7347 5445 5f5f
3571120 374e 4f62 6a65 6374 4650 364f 626a 6563 743a 6628 302c 3129 005f 5f30 7468 6973 3a70 2830 2c38 3629 005f 5f30 5f5f 4133
3571200 383a 7028 302c 3131 3829 005f 5f30 7468 6973 203a 5a74 6c00 5f5f 305f 5f41 3338 203a 5a74 6c00 6973 4754 455f 5f37 4e4f
3571260 626a 6563 7446 5036 4f62 6a65 6374 203a 5a74 4600 7365 7450 726f 705f 5f37 4e4f 626a 6563 7446 5063 663a 6628 302c 3229
3571340 005f 5f30 7468 6973 3a70 2830 2c38 3629 005f 5f31 5f5f 4133 363a 7028 302c 3230 2900 5f5f 315f 5f41 3337 3a70 2830 2c31
3571420 3029 005f 5f30 7468 6973 203a 5a74 6c00 5f5f 315f 5f41 3336 203a 5a74 6c00 5f5f 315f 5f41 3337 203a 5a74 6c00 7365 7450
3571500 726f 705f 5f37 4e4f 626a 6563 7446 5063 6620 3a5a 7446 0073 6574 5072 6f70 5f5f 374e 4f62 6a65 6374 4650 6369 3a66 2830
3571560 2c32 2900 5f5f 3074 6869 733a 7028 302c 3836 2900 5f5f 315f 5f41 3334 3a70 2830 2c32 3029 005f 5f31 5f5f 4133 353a 7028
3571640 302c 3129 005f 5f30 7468 6973 203a 5a74 6c00 5f5f 315f 5f41 3334 203a 5a74 6c00 5f5f 315f 5f41 3335 203a 5a74 6c00 7365
3571720 7450 726f 705f 5f37 4e4f 626a 6563 7446 5063 6920 3a5a 7446 0073 6574 5072 6f70 5f5f 374e 4f62 6a65 6374 4650 6354 313a
3572000 6628 302c 3229 005f 5f30 7468 6973 3a70 2830 2c38 3629 005f 5f31 5f5f 4133 323a 7028 302c 3230 2900 5f5f 315f 5f41 3333
3572060 3a70 2830 2c32 3029 005f 5f30 7468 6973 203a 5a74 6c00 5f5f 315f 5f41 3332 203a 5a74 6c00 5f5f 315f 5f41 3333 203a 5a74
3572140 6c00 7365 7450 726f 705f 5f37 4e4f 626a 6563 7446 5063 5431 203a 5a74 4600 6765 7450 726f 705f 5f37 4e4f 626a 6563 7446
3572220 5063 693a 6628 302c 3230 2900 5f5f 3074 6869 733a 7028 302c 3836 2900 5f5f 305f 5f41 3330 3a70 2830 2c32 3029 005f 5f30
3572300 5f5f 4133 313a 7028 302c 3129 005f 5f30 7468 6973 203a 5a74 6c00 5f5f 305f 5f41 3330 203a 5a74 6c00 5f5f 305f 5f41 3331
3572360 203a 5a74 6c00 6765 7450 726f 705f 5f37 4e4f 626a 6563 7446 5063 6920 3a5a 7446 0067 6574 4174 7472 5f5f 374e 4f62 6a65
3572440 6374 4669 3a66 2830 2c32 3029 005f 5f30 7468 6973 3a70 2830 2c38 3629 005f 5f30 5f5f 4132 393a 7028 302c 3129 005f 5f30
3572520 7468 6973 203a 5a74 6c00 5f5f 305f 5f41 3239 203a 5a74 6c00 6765 7441 7474 725f 5f37 4e4f 626a 6563 7446 6920 3a5a 7446
3572600 0069 6e4f 7264 6572 5f5f 364f 626a 6563 7446 5036 4f62 6a65 6374 3a66 2830 2c31 2900 5f5f 3074 6869 733a 7028 302c 3131
3572660 3829 005f 5f30 5f5f 4132 373a 7028 302c 3131 3829 002f 686f 6465 2f6f 7361 7331 2f61 2f61 622f 7372 632f 6e65 776f 626a
3572740 6563 7473 2f68 7878 2f4f 626a 6563 745f 6462 2e68 7878 005f 5f30 7468 6973 203a 5a74 6c00 5f5f 305f 5f41 3237 203a 5a74
3573020 6c00 696e 4f72 6465 725f 5f36 4f62 6a65 6374 4650 364f 626a 6563 7420 3a5a 7446 0043 6f75 6e74 6572 2e6f 005f 7365 745f
3573100 7061 7261 6d65 7465 725f 7661 6c75 655f 7479 7065 5f5f 3370 6172 616d 6574 6572 4650 6300 5f73 6574 5072 6f70 5f5f 374e
3573160 4f62 6a65 6374 4650 6366 005f 7365 7450 726f 705f 5f37 4e4f 626a 6563 7446 5063 6900 5f73 6574 4e61 6d65 496e 6465 785f
3573240 5f37 436f 756e 7465 7246 5063 005f 6578 706c 6169 6e5f 5f31 3662 6c6f 636b 5f61 7474 7269 6275 7465 7346 5063 005f 6765
3573320 7441 7474 725f 5f37 4e4f 626a 6563 7446 6900 5f73 6574 5f46 555f 4669 6c65 4e61 6d65 5f5f 3846 696c 6555 6e69 7446 5063
3573400 005f 7075 745f 5f37 6f73 7472 6561 6d46 6300 5f73 6574 5072 6f70 5f5f 374e 4f62 6a65 6374 4650 6354 3100 5f69 6f73 7472
3573460 6561 6d5f 696e 6974 005f 6973 4c54 455f 5f37 4e4f 626a 6563 7446 5036 4f62 6a65 6374 005f 6973 4754 455f 5f37 4e4f 626a
3573540 6563 7446 5036 4f62 6a65 6374 005f 6578 706c 6169 6e5f 5f38 4c50 4f62 6a65 6374 4650 6300 5f67 6574 5072 6f70 5f5f 374e
3573620 4f62 6a65 6374 4650 6369 005f 5f5f 6374 5f5f 3665 6e74 6974 7946 7600 5f69 6e4f 7264 6572 5f5f 364f 626a 6563 7446 5036
3573700 4f62 6a65 6374 002f 686f 6d65 2f6f 7361 7331 2f61 2f61 622f 7372 632f 6e65 776f 626a 6563 7473 2f70 726f 672f 4d47 2f43
3573760 2b2b 2e32 3238 3236 2f00 436f 756e 7465 722e 6300 436f 756e 7465 722e 6378 7800 696e 743a 7428 302c 3129 3d72 2830 2c31
3574040 293b 2d32 3134 3734 3833 3634 393b 3231 3437 3438 3336 3437 3b00 6368 6172 3a74 2830 2c32 293d 7228 302c 3229 3b30 3b31
3574120 3237 3b00 6c6f 6e67 3a74 2830 2c33 293d 7228 302c 3129 3b2d 3231 3437 3438 3336 3438 3b32 3134 3734 3833 3634 373b 0073
3574200 686f 7274 3a74 2830 2c34 293d 7228 302c 3129 3b2d 3332 3736 383b 3332 3736 373b 0075 6e73 6967 6e65 6420 6368 6172 3a74
3574260 2830 2c35 293d 7228 302c 3129 3b30 3b32 3535 3b00 756e 7369 676e 6564 2073 686f 7274 3a74 2830 2c36 293d 7228 302c 3129
3574340 3b30 3b36 3535 3335 3b00 756e 7369 676e 6564 206c 6f6e 673a 7428 302c 3729 3d72 2830 2c31 293b 303b 2d31 3b00 756e 7369
3574420 676e 6564 2069 6e74 3a74 2830 2c38 293d 7228 302c 3129 3b30 3b2d 313b 0066 6c6f 6174 3a74 2830 2c39 293d 7228 302c 3129
3574500 3b34 3b30 3b00 646f 7562 6c65 3a74 2830 2c31 3029 3d72 2830 2c31 293b 383b 303b 0076 6f69 643a 7428 302c 3131 293d 2830
3574560 2c31 3129 003f 3f3f 3a74 2830 2c31 3229 3d28 302c 3129 005f 5f76 7074 703a 7428 302c 3133 293d 2a28 302c 3134 293d 6628
3574640 302c 3129 005f 5f6d 7074 723a 5428 302c 3135 293d 7338 643a 2830 2c34 292c 302c 3136 3b69 3a28 302c 3429 2c31 362c 3136
3574720 3b66 3a28 302c 3133 292c 3332 2c33 323b 3b00 5f50 4656 5f3a 7428 302c 3136 293d 2a28 302c 3137 293d 6628 302c 3229 005f
3575000 5046 495f 3a74 2930 2c31 3329 0065 7272 6e6f 3a47 2830 2c31 2900 7379 735f 6e65 7272 3a47 2830 2c31 2900 656e 7669 726f
3575060 6e3a 4728 302c 3139 293d 2a28 302c 3230 293d 2a28 302c 3229 0065 6e64 3a47 2830 2c31 2900 6574 6578 743a 4728 302c 3129
3575140 0065 6461 7461 3a47 2830 2c31 2900 6f70 7461 7267 3a47 2830 2c32 3029 006f 7074 696e 643a 4728 302c 3129 006f 7074 6572
3575220 723a 4728 302c 3129 0070 7472 6469 6666 5f74 3a74 2830 2c31 2900 7369 7a65 5f74 3a74 2830 2c38 2900 7374 7265 616d 706f
3575300 733a 7428 302c 3129 0073 7472 6561 6d6f 6666 3a74 2830 2c31 2900 696f 5f73 7461 7465 3a54 2830 2c32 3129 3d65 676f 6f64
3575360 6269 745f 5f69 6f5f 7374 6174 653a 302c 656f 6662 6974 5f5f 696f 5f73 7461 7465 3a31 2c66 6169 6c62 6974 5f5f 696f 5f73
3575440 7461 7465 3a32 2c62 6164 6269 745f 5f69 6f5f 7374 6174 653a 332c 6861 7264 6661 696c 5f5f 696f 5f73 7461 7465 3a34 2c3b
3575520 006f 7065 6e5f 6d6f 6465 3a54 2330 2c32 3229 3d65 696e 5f5f 6f70 656e 5f6d 6f64 653a 302c 6f75 745f 5f6f 7065 6e5f 6d6f
3575600 6465 3a31 2c61 7465 5f5f 6f70 656e 5f6d 6f64 653a 322c 6170 705f 5f6f 7065 6e5f 6d6f 6465 3a33 2c74 7275 6e63 5f5f 6f70
3575660 656e 5f6d 6f64 653a 342c 6e6f 6372 6561 7465 5f5f 6f70 656e 5f6d 6f64 653a 352c 6e6f 7265 706c 6163 655f 5f6f 7065 6e5f
3575740 6d6f 6465 3a36 2c3b 0073 6565 6b5f 6469 723a 5428 302c 3233 293d 6562 6567 5f5f 7365 656b 5f64 6972 3a30 2c63 7572 5f5f
```

```
3576020 7365 656b 5f64 6972 3a31 2c65 6e64 5f5f 7365 656b 5f64 6972 3a32 2c3b 005f 5f45 313a 5428 302c 3234 293d 6573 6b69 7077
3576100 735f 5f5f 5f45 313a 302c 6c65 6674 5f5f 5f5f 4531 3a31 2c72 6967 6874 5f5f 5f5f 4531 3a32 2c69 6e74 6572 6e61 6c5f 5f5f
3576160 5f45 313a 332c 6465 635f 5f5f 5f45 313a 342c 6f63 745f 5f5f 5f45 313a 352c 6865 785f 5f5f 5f45 313a 362c 7368 6f77 6261
3576240 7365 5f5f 5f5f 4531 3a37 2c5c 0073 686f 7770 6f69 6e74 5f5f 5f5f 4531 3a38 2c75 7070 6572 6361 7365 5f5f 5f5f 4531 3a39
3576320 2c73 686f 7770 6f73 5f5f 5f5f 4531 3a31 302c 7363 6965 6e74 6966 6963 5f5f 5f5f 4531 3a31 312c 6669 7865 645f 5f5f 5f45
3576400 313a 3132 2c75 6e69 7462 7566 5f5f 5f5f 4531 3a31 332c 7374 6469 6f5f 5f5f 5f45 313a 3134 2c3b 005f 5f45 323a 5428 302c
3576460 3235 293d 6573 6b69 7070 696e 675f 5f5f 5f45 323a 302c 7469 6564 5f5f 5f5f 4532 3a31 2c3b 0069 6f73 3a54 2830 2c32 3629
3576540 3d73 3630 6e75 7365 725f 5f33 696f 733a 2830 2c31 292c 302c 3332 3b78 5f75 7365 725f 5f33 696f 733a 2830 2c33 3029 3d2a
3576620 2830 2c32 3729 3d78 7569 6f73 5f75 7365 725f 756e 696f 6e3a 2c33 322c 3332 3b62 705f 5f33 696f 733a 2830 2c33 3129 3d2a
3576700 2830 2c32 3829 3d78 7373 7472 6561 6d62 7566 3a2c 3634 2c33 323b 7374 6174 655f 5f33 696f 733a 2830 2c31 292c 3936 2c33
3576760 323b 6973 7065 6369 616c 5f5f 3369 6f73 3a28 302c 3129 2c31 3238 2c33 323b 6f73 7065 6369 616c 5f5f 3369 6f73 3a28 302c
3577040 3129 2c31 3630 2c33 323b 6973 6678 5f73 7065 6369 616c 5f5f 3369 6f73 3a28 302c 3129 2c31 3932 2c33 323b 6f73 6678 5f73
3577120 7065 6369 616c 5f5f 3369 6f73 3a28 302c 3129 2c32 3234 2c33 323b 5c00 6465 6c62 7566 5f5f 3369 6f73 3a28 302c 3129 2c32
3577200 3536 2c33 323b 785f 7469 655f 5f33 696f 733a 2830 2c33 3229 3d2a 2830 2c32 3929 3d78 736f 7374 7265 616d 3a2c 3238 382c
3577260 3332 3b78 5f66 6c61 6773 5f5f 3369 6f73 3a28 302c 3129 2c33 3230 2c33 323b 785f 7072 6563 6973 696f 6e5f 5f33 696f 733a
3577340 2830 2c34 292c 3335 322c 3136 3b78 5f66 696c 6c5f 5f33 696f 733a 2830 2c32 292c 3336 382c 383b 785f 7769 6474 685f 5f33
3577420 696f 733a 2830 2c34 292c 3338 342c 3136 3b61 7373 6967 6e5f 7072 6976 6174 655f 5f33 696f 733a 2830 2c31 292c 3431 362c
3577500 3332 3b5f 5f76 7074 725f 5f33 696f 733a 2830 2c33 3329 3d2a 2830 2c31 3529 2c34 3438 2c33 323b 3b00 6261 7365 6669 656c
3577560 645f 5f33 696f 733a 4728 302c 3129 0061 646a 7573 7466 6965 6c64 5f5f 3369 6f73 3a47 2830 2c31 2900 666c 6f61 7466 6965
3577640 6c64 5f5f 3369 6f73 3a47 2830 2c31 2900 6e65 7874 6269 745f 5f33 696f 733a 4728 302c 3129 006e 6578 7477 6f72 645f 5f33
3577720 696f 733a 4728 302c 3129 0073 7464 696f 666c 7573 685f 5f33 696f 733a 4728 302c 3136 2900 696f 733a 5a63 696f 733b 3b5f
3600000 5f63 745f 5f33 696f 7346 5039 7374 7265 616d 6275 6620 5f5f 6374 5f5f 3369 6f73 4676 205f 5f63 745f 5f33 696f 7346 5233
3600060 696f 7320 5f5f 6474 5f5f 3369 6f73 4676 2066 6c61 6773 5f5f 3369 6f73 4676 2066 6c61 6773 5f5f 3369 6f73 466c 2073 6574
3600140 665f 5f33 696f 7346 6c54 3120 7365 7466 5f5f 3369 6f73 466c 2075 6e73 6574 665f 5f33 696f 7346 6c20 7769 6474 685f 5f33
3600220 696f 7346 7620 7769 6474 685f 5f33 696f 7346 6920 7469 655f 5f33 696f 7346 5037 6f73 7472 6561 6d20 5c00 7469 655f 5f33
3600300 696f 7346 7620 6669 6c6c 5f5f 3369 6f73 4663 2066 696c 6c5f 5f33 696f 7346 7620 7072 6563 6973 696f 6e5f 5f33 696f 7346
3600360 6920 7072 6563 6973 696f 6e5f 5f33 696f 7346 7620 7264 7374 6174 655f 5f33 696f 7346 7620 5f5f 6f70 5076 5f5f 3369 6f73
3600440 4676 205f 5f6e 745f 5f33 696f 7346 7620 656f 665f 5f33 696f 7346 7620 6661 696c 5f5f 3369 6f73 4676 2062 6164 5f5f 3369
3600520 6f73 4676 2067 6f6f 645f 5f33 696f 7346 7620 636c 6561 725f 5f33 696f 7346 6920 7264 6275 665f 5f33 696f 7346 7620 5c00
3600600 6977 6f72 645f 5f33 696f 7346 6920 7077 6f72 645f 5f33 696f 7346 6920 6269 7461 6c6c 6f63 5f5f 3369 6f73 5346 7620 7861
3600660 6c6c 6f63 5f5f 3369 6f73 5346 7620 7572 6573 697a 655f 5f33 696f 7346 6920 7379 6e63 5f77 6974 685f 7374 6469 6f5f 5f33
3600740 696f 7353 4676 2073 6574 7374 6174 655f 5f33 696f 7346 6920 696e 6974 5f5f 3369 6f73 4650 3973 7472 6561 6d62 7566 205f
3601020 5f61 735f 5f33 696f 7346 5233 696f 7320 736b 6970 5f5f 3369 6f73 4669 203b 6261 7365 6669 656c 645f 5f33 696f 7320 5c00
3601100 6164 6a75 7374 6669 656c 645f 5f33 696f 7320 666c 6f61 7466 6965 6c64 5f5f 3369 6f73 206e 6578 7462 6974 5f5f 3369 6f73
3601160 206e 6578 7477 6f72 645f 5f33 696f 7320 7374 6469 6f66 6c75 7368 5f5f 3369 6f73 203b 3b00 7374 7265 616d 6275 663a 5428
3601240 302c 3238 293d 7334 3061 6c6c 6f63 5f5f 3973 7472 6561 6d62 7566 3a28 302c 3429 2c30 2c31 363b 785f 756e 6275 665f 5f39
3601320 7374 7265 616d 6275 663a 2830 2c34 292c 3136 2c31 363b 785f 6261 7365 5f5f 3973 7472 6561 6d62 7566 3a28 302c 3230 292c
3601400 3332 2c33 323b 795f 7062 6173 655f 5f39 7374 7265 616d 6275 663a 2830 2c32 3029 2c36 342c 3332 3b78 5f70 7074 725f 5f39
3601460 7374 7265 616d 6275 663a 2830 2c32 3029 2c39 362c 3332 3b78 5f65 7070 7472 5f5f 3973 7472 6561 6d62 7566 3a28 302c 3230
3601540 292c 3132 382c 3332 3b78 5f67 7074 725f 5f39 7374 7265 616d 6275 663a 2830 2c32 3029 2c31 3630 2c33 323b 785f 6567 7074
3601620 725f 5f39 7374 7265 616d 6275 663a 2830 2c32 3029 2c31 3932 2c33 323b 5c00 785f 6562 6163 6b5f 5f39 7374 7265 616d 6275
3601700 663a 2830 2c32 3029 2c32 3234 2c33 323b 785f 626c 656e 5f5f 3973 7472 6561 6d62 7566 3a28 302c 3129 2c32 3536 2c33 323b
3601760 5f5f 7670 7472 5f5f 3973 7472 6561 6d62 7566 3a28 302c 3333 292c 3238 382c 3332 3b3b 0073 7472 6561 6d62 7566 3a5a 6373
3602040 7472 6561 6d62 7566 3b3b 5f5f 6374 5f5f 3973 7472 6561 6d62 7566 4652 3973 7472 6561 6d62 7566 205f 5f63 745f 5f39 7374
3602120 7265 616d 6275 6646 7620 5f5f 6374 5f5f 3973 7472 6561 6d62 7566 4650 6369 205f 5f63 745f 5f39 7374 7265 616d 6275 6646
3602200 5063 6954 3220 5f5f 6173 5f5f 3973 7472 6561 6d62 7566 4652 3973 7472 6561 6d62 7566 2064 6270 5f5f 3973 7472 6561 6d62
3602260 7566 4676 2062 6173 655f 5f39 7374 7265 6163 6275 6646 7620 7062 6173 655f 5f39 7374 7265 616d 6275 6646 7620 5c00 7070
3602340 7472 5f5f 3973 7472 6561 6d62 7566 4676 2065 7070 7472 5f5f 3973 7472 6561 6d62 7566 4676 2067 7074 725f 5f39 7374 7265
3602420 616d 6275 6646 7620 6567 7074 725f 5f39 7374 7265 616d 6275 6646 7620 6562 6163 6b5f 5f39 7374 7265 616d 6275 6646 7620
3602500 6562 7566 5f5f 3973 7472 6561 6d62 7566 4676 2062 6c65 6e5f 5f39 7374 7265 616d 6275 6646 7620 7365 7470 5f5f 3973 7472
3602560 6561 6d62 7566 4650 6354 3120 7365 7467 5f5f 3973 7472 6561 6d62 7566 4650 634e 3231 2070 6275 6670 5f5f 3973 7472 6561
3602640 6d62 7566 4669 205c 0067 6275 6670 5f5f 3973 7472 6561 6d62 7566 4669 2073 6574 625f 5f39 7374 7265 616d 6275 6646 5063
3602720 5431 6920 756e 6275 6666 6572 6564 5f5f 3973 7472 6561 6d62 7566 4676 2075 6e62 7566 6665 7265 645f 5f39 7374 7265 616d
3603000 6275 6646 6920 616c 6c6f 6361 7465 5f5f 3973 7472 6561 6d62 7566 4676 2064 6f61 6c6c 6f63 6174 655f 5f39 7374 7265 616d
3603060 6275 6646 7620 6f76 6572 666c 6f77 5f5f 3973 7472 6561 6d62 7566 4669 2075 6e64 6572 666c 6f77 5f5f 3973 7472 6561 6d62
```

```
3603140  7566 4676 205c 0070 6261 636b 6661 696c 5f5f 3973 7472 6561 6d62 7566 4669 2073 796e 635f 5f39 7374 7265 616d 6275 6646
3603220  7620 7365 656b 6f66 665f 5f39 7374 7265 616d 6275 6646 6c38 7365 656b 5f64 6972 6920 7365 656b 706f 735f 5f39 7374 7265
3603300  616d 6275 6646 6c69 2078 7370 7574 6e5f 5f39 7374 7265 616d 6275 6646 5043 6369 2078 7367 6574 6e5f 5f39 7374 7265 616d
3603360  6275 6646 5063 6920 696e 5f61 7661 696c 5f5f 3973 7472 6561 6462 7566 4676 206f 7574 5f77 6169 7469 6e67 5f5f 3973 7472
3603440  6561 6d62 7566 4676 205c 0073 6765 7463 5f5f 3973 7472 6561 6d62 7566 4676 2073 6e65 7874 635f 5f39 7374 7265 616d 6275
3603520  6646 7620 7362 756d 7063 5f5f 3973 7472 6561 6d62 7566 4676 2073 746f 7373 635f 5f39 7374 7265 616d 6275 6646 7620 7370
3603600  7574 6261 636b 635f 5f39 7374 7265 616d 6275 6646 6320 7370 7574 635f 5f39 7374 7265 616d 6275 6646 6920 7370 7574 6e5f
3603660  5f39 7374 7265 616d 6275 6646 5043 6369 2073 6765 746e 5f5f 3973 7472 6561 6d62 7566 4650 6369 2073 6574 6275 665f 5f39
3603740  7374 7265 616d 6275 6646 5063 6920 5c00 7365 7462 7566 5f5f 3973 7472 6561 6d62 7566 4650 5563 6920 7365 7462 7566 5f5f
3604020  3973 7472 6561 6462 7566 4650 6369 5432 205f 5f64 745f 5f39 7374 7265 616d 6275 6646 7620 785f 736e 6578 7463 5f5f 3973
3604100  7472 6561 6d62 7566 4676 203b 3b3b 0069 7374 7265 616d 3a54 2830 2c33 3429 3d73 3732 785f 6763 6f75 6e74 5f5f 3769 7374
3604160  7265 616d 3a28 302c 3129 2c30 2c33 323b 5f5f 7670 7472 5f5f 3769 7374 7265 616d 3a28 302c 3333 292c 3332 2c33 323b 5069
3604240  6f73 3a28 302c 3335 293d 2a28 302c 3236 292c 3634 2c33 323b 4f69 6f73 3a28 302c 3236 292c 3936 2c34 3830 3b3b 0069 7374
3604320  7265 616d 3a5a 6369 7374 7265 616d 3b69 6f73 3b5f 5f63 745f 5f37 6973 7472 6561 6d46 5039 7374 7265 616d 6275 6620 5f5f
3604400  6374 5f5f 3769 7374 7265 616d 4676 205f 5f63 745f 5f37 6973 7472 6561 6d46 5039 7374 7265 616d 6275 6669 5037 6f73 7472
3604460  6561 6d20 5f5f 6374 5f5f 3769 7374 7265 616d 4669 5063 5431 205f 5f63 745f 5f37 6973 7472 6561 6d46 6954 3150 376f 7374
3604540  7265 616d 205f 5f63 745f 5f37 6973 7472 6561 6d46 5237 6973 7472 6561 6d20 5f5f 6474 5f5f 3769 7374 7265 616d 4676 205c
3604620  0069 7066 785f 5f37 6973 7472 6561 6d46 6920 6973 6678 5f5f 3769 7374 7265 616d 4676 2073 6565 6b67 5f5f 3769 7374 7265
3604700  616d 466c 2073 6565 6b67 5f5f 3769 7374 7265 616d 466c 3873 6565 6b5f 6469 7220 7465 6c6c 675f 5f37 6973 7472 6561 6d46
3604760  7620 5f5f 7273 5f5f 3769 7374 7265 616d 4650 4652 3769 7374 7265 616d 5f52 3769 7374 7265 616d 205f 5f72 735f 5f37 6973
3605040  7472 6561 6d46 5046 5233 696f 735f 5233 696f 7320 5f5f 7273 5f5f 3769 7374 7265 616d 4650 6320 5f5f 7273 5f5f 3769 7374
3605120  7265 616d 4650 5563 205c 005f 5f72 735f 5f37 6973 7472 6561 6d46 5255 6320 5f5f 7273 5f5f 3769 7374 7265 616d 4652 6320
3605200  5f5f 7273 5f5f 3769 7374 7265 616d 4652 7320 5f5f 7273 5f5f 3769 7374 7265 616d 4652 6920 5f5f 7273 5f5f 3769 7374 7265
3605260  616d 4652 6c20 5f5f 7273 5f5f 3769 7374 7265 616d 4652 5573 205f 5f72 735f 5f37 6973 7472 6561 6d46 5255 6920 5f5f 7273
3605340  5f5f 3769 7374 7265 616d 4652 556c 205f 5f72 735f 5f37 6973 7472 6561 6d46 5266 205f 5f72 735f 5f37 6973 7472 6561 6d46
3605420  5264 205f 5f72 735f 5f37 6973 7472 6561 6d46 5039 7374 7265 616d 6275 6620 5c00 6765 745f 5f37 6973 7472 6561 6d46 5063
3605500  6963 2067 6574 5f5f 3769 7374 7265 616d 4650 5563 6963 2067 6574 5f5f 3769 7374 7265 616d 4652 3973 7472 6561 6d62 7566
3605560  6320 6765 745f 5f37 6973 7472 6561 6d46 5255 6320 6765 745f 5f37 6973 7472 6561 6d46 5263 2067 6574 5f5f 3769 7374 7265
3605640  616d 4676 2067 6574 6c69 6e65 5f5f 3769 7374 7265 616d 4650 6369 6320 6765 746c 696e 655f 5f37 6973 7472 6561 6d46 5055
3605720  6369 6320 7065 656b 5f5f 3769 7374 7265 6161 4676 2069 676e 6f72 655f 5f37 6973 7472 6561 6146 6954 3120 5c00 7265 6164
3606000  5f5f 3769 7374 7265 616d 4650 6369 2072 6561 645f 5f37 6973 7472 6561 6d46 5055 6369 2067 636f 756e 745f 5f37 6973 7472
3606060  6561 6d46 7620 7075 7462 6163 6b5f 5f37 6973 7472 6561 6d46 6320 7379 6e63 5f5f 3769 7374 7265 616d 4676 2064 6f5f 6970
3606140  6678 5f5f 3769 7374 7265 616d 4669 2065 6174 7768 6974 655f 5f37 6973 7472 6561 6d46 7620 7867 6574 5f5f 3769 7374 7265
3606220  616d 4650 6320 3b3b 3b00 6f73 7472 6561 6d3a 5428 302c 3239 293d 7336 385f 5f76 7074 725f 5f37 6f73 7472 6561 6d3a 2830
3606300  2c33 3329 2c30 2c33 323b 5069 6f73 3a28 302c 3335 292c 3332 2c33 323b 4f69 6f73 3a28 302c 3236 292c 3634 2c34 3830 3b3b
3606360  006f 7374 7265 616d 3a5a 636f 7374 7265 616d 3b69 6f73 3b5f 5f63 745f 5f37 6f73 7472 6561 6d46 5039 7374 7265 616d 6275
3606440  6620 5f5f 6374 5f5f 376f 7374 7265 616d 4676 205f 5f63 745f 5f37 6f73 7472 6561 6d46 6920 5f5f 6374 5f5f 376f 7374 7265
3606520  616d 4669 5063 205f 5f63 745f 5f37 6f73 7472 6561 6d46 5237 6f73 7472 6561 6d20 5f5f 6474 5f5f 376f 7374 7265 616d 4676
3606600  206f 7066 785f 5f37 6f73 7472 6561 6d46 7620 6f73 6678 5f5f 376f 7374 7265 616d 4676 2066 6c75 7368 5f5f 376f 7374 7265
3606660  616d 4676 205c 0073 6565 6b70 5f5f 376f 7374 7265 616d 466c 2073 6565 6b70 5f5f 376f 7374 7265 616d 466c 3873 6565 6b5f
3606740  6469 7220 7465 6c6c 705f 5f37 6f73 7472 6561 6d46 7620 7075 745f 5f37 6f73 7472 6561 6d46 6320 5f5f 6c73 5f5f 376f 7374
3607020  7265 616d 4663 205f 5f6c 735f 5f37 6f73 7472 6561 6d46 5563 205f 5f6c 735f 5f37 6f73 7472 6561 6d46 5043 6320 5f5f 6c73
3607100  5f5f 376f 7374 7265 616d 4669 205f 5f6c 735f 5f37 6f73 7472 6561 6d46 6c20 5f5f 6c73 5f5f 376f 7374 7265 616d 4664 205f
3607160  5f6c 735f 5f37 6f73 7472 6561 6d46 6620 5c00 5f5f 6c73 5f5f 376f 7374 7265 616d 4655 6920 5f5f 6c73 5f5f 376f 7374 7265
3607240  616d 4655 6c20 5f5f 6c73 5f5f 376f 7374 7265 616d 4650 7620 5f5f 6c73 5f5f 376f 7374 7265 616d 4650 3973 7472 6561 6d62
3607320  7566 205f 5f6c 735f 5f37 6f73 7472 6561 6d46 7320 5f5f 6c73 5f5f 376f 7374 7265 616d 4655 7320 5f5f 6c73 5f5f 376f 7374
3607400  7265 616d 4650 4652 376f 7374 7265 616d 5f52 376f 7374 7265 616d 205f 5f6c 735f 5f37 6f73 7472 6561 6d46 5046 5233 696f
3607460  735f 5233 696f 7320 7772 6974 655f 5f37 6f73 7472 6561 6d46 5043 6369 205c 0077 7269 7465 5f5f 376f 7374 7265 616d 4650
3607540  4355 6369 2064 6f5f 6f7c 6678 5f5f 376f 7374 7265 616d 4676 2064 6f5f 6f73 6678 5f5f 376f 7374 7265 616d 4676 203b 3b3b
3607620  0070 7574 5f5f 376f 7374 7265 616d 4663 3a66 2930 2c33 3629 3d2a 2830 2c32 3929 005f 5f30 7468 6973 3a70 2830 2c33 3629
3607700  005f 5f30 633a 7028 302c 3229 002f 7573 722f 4343 2f73 756e 342f 696e 636c 2f69 6f73 7472 6561 6d2e 6800 5f5f 3074 6869
3607760  733a 7228 302c 3336 2900 5f5f 3074 6869 7320 3a5a 746c 005f 5f30 6320 3a5a 746c 0070 7574 5f5f 376f 7374 7265 616d 4663
3610040  203a 5a74 4600 696f 7374 7265 616d 3a54 2830 2c33 3729 3d73 3830 785f 6763 6f75 6e74 5f5f 3769 7374 7265 616d 3a28 302c
3610120  3129 2c30 2c33 323b 5f5f 7670 7472 5f5f 3769 7374 7265 616d 3a28 302c 3333 292c 3332 2c33 323b 5069 6f73 3a28 302c 3335
3610200  292c 3634 2c33 323b 4f6f 7374 7265 616d 3a28 302c 3239 292c 3936 2c35 3434 3b3b 0069 6f73 7472 6561 6d3a 5a63 696f 7374
```

| | | | | | | | | | | | | | | | | | | | | | | | | |
|---|---|---|---|---|---|---|---|---|---|---|---|---|---|---|---|---|---|---|---|---|---|---|---|---|
| 3610260 | 7265 | 616d | 3b69 | 7374 | 7265 | 616d | 205f | 7374 | 7265 | 616d | 2069 | 6f73 | 3b5f | 5f63 | 745f | 5f38 | 696f | 7374 | 7265 | 616d | 4650 | 3973 | 7472 | 6561 |
| 3610340 | 6d62 | 7566 | 205f | 5f63 | 745f | 5f38 | 696f | 7374 | 7265 | 616d | 4676 | 205f | 5f63 | 745f | 5f38 | 696f | 7374 | 7265 | 616d | 4652 | 3869 | 6f73 | 7472 | 6561 |
| 3610420 | 6d20 | 5f5f | 6474 | 5f5f | 3869 | 6f73 | 7472 | 6561 | 6d46 | 7620 | 3b3b | 3b00 | 6369 | 6e3a | 4728 | 302c | 3338 | 293d | 7873 | 6973 | 7472 | 6561 | 6d5f | 7769 |
| 3610500 | 7468 | 6173 | 7369 | 676e | 3a00 | 636f | 7574 | 3a47 | 2830 | 2c33 | 3929 | 3d78 | 736f | 7374 | 7265 | 616d | 5f77 | 6974 | 6861 | 7373 | 6967 | 6e3a | 0063 | 6572 |
| 3610560 | 723a | 4728 | 302c | 3339 | 2900 | 636c | 6f67 | 3a47 | 2830 | 2c33 | 3929 | 0049 | 6f73 | 7472 | 6561 | 6d5f | 696e | 6974 | 3a54 | 2830 | 2c34 | 3029 | 3d73 | 315f |
| 3610640 | 5f57 | 395f | 5f31 | 3349 | 6f73 | 7472 | 6561 | 6d5f | 696e | 6974 | 3a28 | 302c | 3229 | 2c30 | 2c38 | 3b3b | 0073 | 7464 | 7374 | 6174 | 7573 | 5f5f | 3133 | 496f |
| 3610720 | 7374 | 7265 | 616d | 5f69 | 6e69 | 743a | 4728 | 302c | 3129 | 0069 | 6e69 | 7463 | 6f75 | 6e74 | 5f5f | 3133 | 496f | 7374 | 7265 | 616d | 5f69 | 6e69 | 743a | 4728 |
| 3611000 | 302c | 3129 | 0049 | 6f73 | 7472 | 6561 | 6d5f | 696e | 6974 | 3a5a | 6349 | 6f73 | 7472 | 6561 | 6d5f | 696e | 6974 | 3b3b | 5f5f | 6374 | 5f5f | 3133 | 496f | 7374 |
| 3611060 | 7265 | 616d | 5f69 | 6e69 | 7446 | 7620 | 5f5f | 6474 | 5f5f | 3133 | 496f | 7374 | 7265 | 616d | 5f69 | 6e69 | 7446 | 7620 | 3b73 | 7464 | 7374 | 6174 | 7573 | 5f5f |
| 3611140 | 3133 | 496f | 7374 | 7265 | 616d | 5f69 | 6e69 | 7420 | 696e | 6974 | 636f | 756e | 745f | 5f31 | 3349 | 6f73 | 7472 | 6561 | 6d5f | 696e | 6974 | 203b | 4069 | 6f73 |
| 3611220 | 3b00 | 696f | 7374 | 7265 | 616d | 5f69 | 6e69 | 743a | 5329 | 302c | 3430 | 2900 | 4750 | 543a | 7428 | 302c | 3133 | 2900 | 736d | 616e | 6970 | 5f69 | 6e74 | 3a54 |
| 3611300 | 2930 | 2c34 | 3129 | 3d73 | 3866 | 6374 | 5f5f | 3130 | 736d | 616e | 6970 | 5f69 | 6e74 | 3a28 | 302c | 3432 | 293d | 2a28 | 302c | 3433 | 293d | 6628 | 302c | 3335 |
| 3611360 | 292c | 302c | 3332 | 3b61 | 7267 | 5f5f | 3130 | 736d | 616e | 6970 | 5f69 | 6e74 | 3a28 | 302c | 3129 | 2c33 | 322c | 3332 | 3b3b | 0073 | 6d61 | 6e69 | 705f | 696e |
| 3611440 | 743a | 5a63 | 736d | 616e | 6970 | 5f69 | 6e74 | 3b3b | 5f5f | 6374 | 5f5f | 3130 | 736d | 616e | 6970 | 5f69 | 6e74 | 4650 | 4652 | 3369 | 6f73 | 695f | 5233 | 696f |
| 3611520 | 7369 | 203b | 3b5f | 5f6c | 735f | 5f46 | 5237 | 6f73 | 7472 | 6561 | 6d52 | 3130 | 736d | 616e | 6970 | 5f69 | 6e74 | 205f | 5f72 | 735f | 5f46 | 5237 | 6973 | 7472 |
| 3611600 | 6561 | 6d52 | 3130 | 736d | 616e | 6970 | 5f69 | 6e74 | 203b | 0073 | 6170 | 706c | 795f | 696e | 743a | 5428 | 302c | 3434 | 293d | 7334 | 6663 | 745f | 5f31 | 3073 |
| 3611660 | 6170 | 706c | 795f | 696e | 743a | 2830 | 2c34 | 3229 | 2c30 | 2c33 | 323b | 3b00 | 7361 | 7070 | 6c79 | 5f69 | 6e74 | 3a5a | 6373 | 6170 | 706c | 795f | 696e | 743b |
| 3611740 | 3b5f | 5f63 | 745f | 5f31 | 3073 | 6170 | 706c | 795f | 696e | 7446 | 5046 | 5233 | 696f | 7369 | 5f52 | 3369 | 6f73 | 205f | 5f63 | 6c5f | 5f31 | 3073 | 6170 | 706c |
| 3612020 | 795f | 696e | 7446 | 6920 | 3b3b | 3b00 | 696d | 616e | 6970 | 5f69 | 6e74 | 3a54 | 2830 | 2c34 | 3529 | 3d73 | 3866 | 6374 | 5f5f | 3130 | 696d | 616e | 6970 | 5f69 |
| 3612100 | 6e74 | 3a28 | 302c | 3436 | 293d | 2a28 | 302c | 3437 | 293d | 6628 | 302c | 3438 | 293d | 2a28 | 302c | 3334 | 292c | 302c | 3332 | 3b61 | 7267 | 5f5f | 3130 | 696d |
| 3612160 | 616e | 6970 | 5f69 | 6e74 | 3a28 | 302c | 3129 | 2c33 | 322c | 3332 | 3b3b | 0069 | 6d61 | 6e69 | 705f | 696e | 743a | 5a63 | 696d | 616e | 6970 | 5f69 | 6e74 | 3b3b |
| 3612240 | 5f5f | 6374 | 5f5f | 3130 | 696d | 616e | 6970 | 5f69 | 6e74 | 4650 | 4652 | 3769 | 7374 | 7265 | 616d | 695f | 5237 | 6973 | 7472 | 6561 | 6d69 | 203b | 3b5f | 5f72 |
| 3612320 | 735f | 5f46 | 5237 | 6973 | 7472 | 6561 | 6d52 | 3130 | 6961 | 616e | 6970 | 5f69 | 6e74 | 203b | 0069 | 6170 | 706c | 795f | 696e | 743a | 5428 | 302c | 3439 | 293d |
| 3612400 | 7334 | 6663 | 745f | 5f31 | 3069 | 6170 | 706c | 795f | 696e | 743a | 2830 | 2c34 | 3629 | 2c30 | 2c33 | 323b | 3b00 | 6961 | 7070 | 6c79 | 5f69 | 6e74 | 3a5a | 6369 |
| 3612460 | 6170 | 706c | 795f | 696e | 743b | 3b5f | 5f63 | 745f | 5f31 | 3069 | 6170 | 706c | 795f | 696e | 7446 | 5046 | 5237 | 6973 | 7472 | 6561 | 6d69 | 5f52 | 3769 | 7374 |
| 3612540 | 7265 | 616d | 205f | 5f63 | 6c5f | 5f31 | 3069 | 6170 | 706c | 795f | 696e | 7446 | 6920 | 3b3b | 3b00 | 6f6d | 616e | 6970 | 5f69 | 6e74 | 3a54 | 2830 | 2c35 | 3029 |
| 3612620 | 3d73 | 3866 | 6374 | 5f5f | 3130 | 6f6d | 616e | 6970 | 5f69 | 6e74 | 3a28 | 302c | 3531 | 293d | 2a28 | 302c | 3532 | 293d | 6628 | 302c | 3336 | 292c | 302c | 3332 |
| 3612700 | 3b61 | 7267 | 5f5f | 3130 | 6f6d | 616e | 6970 | 5f69 | 6e74 | 3a28 | 302c | 3129 | 2c33 | 322c | 3332 | 3b3b | 006f | 6d61 | 6e69 | 705f | 696e | 743a | 5a63 | 6f6d |
| 3612760 | 616e | 6970 | 5f69 | 6e74 | 3b3b | 5f5f | 6374 | 5f5f | 3130 | 6f6d | 616e | 6970 | 5f69 | 6e74 | 4650 | 4652 | 376f | 7374 | 7265 | 616d | 695f | 5237 | 6f73 | 7472 |
| 3613040 | 6561 | 6d69 | 203b | 3b5f | 5f6c | 735f | 5f46 | 5237 | 6f73 | 7472 | 6561 | 6d52 | 3130 | 6f6d | 616e | 6970 | 5f69 | 6e74 | 203b | 006f | 6170 | 706c | 795f | 696e |
| 3613120 | 743a | 5428 | 302c | 3533 | 293d | 7334 | 6663 | 745f | 5f31 | 306f | 6170 | 706c | 795f | 696e | 743a | 2830 | 2c35 | 3129 | 2c30 | 2c33 | 323b | 3b00 | 6f61 | 7070 |
| 3613200 | 6c79 | 5f69 | 6e74 | 3a5a | 636f | 6170 | 706c | 795f | 696e | 743b | 3b5f | 5f63 | 745f | 5f31 | 306f | 6170 | 706c | 795f | 696e | 7446 | 5046 | 5237 | 6f73 | 7472 |
| 3613260 | 6561 | 6d69 | 5f52 | 376f | 7374 | 7265 | 616d | 205f | 5f63 | 6c5f | 5f31 | 306f | 6170 | 706c | 795f | 696e | 7446 | 6920 | 3b3b | 3b00 | 696f | 6d61 | 6e69 | 705f |
| 3613340 | 696e | 743a | 5428 | 302c | 3534 | 293d | 7338 | 6663 | 745f | 5f31 | 3169 | 6f6d | 616e | 6970 | 5f69 | 6e74 | 3a28 | 302c | 3535 | 293d | 2a28 | 302c | 3536 | 293d |
| 3613420 | 6628 | 302c | 3537 | 293d | 2a28 | 302c | 3337 | 292c | 302c | 3332 | 3b61 | 7267 | 5f5f | 3131 | 696f | 6d61 | 6e69 | 705f | 696e | 743a | 2830 | 2c31 | 292c | 3332 |
| 3613500 | 2c33 | 323b | 3b00 | 696f | 6d61 | 6e69 | 705f | 696e | 743a | 5a63 | 696f | 6d61 | 6e69 | 705f | 696e | 743b | 3b5f | 5f63 | 745f | 5f31 | 3169 | 6f6d | 616e | 6970 |
| 3613560 | 5f69 | 6e74 | 4650 | 4652 | 3869 | 6f73 | 7472 | 6561 | 6d69 | 5f52 | 3869 | 6f73 | 7472 | 6561 | 6d69 | 203b | 3b5f | 5f6c | 735f | 5f46 | 5238 | 696f | 7374 | 7265 |
| 3613640 | 616d | 5231 | 3169 | 6f6d | 616e | 6970 | 5f69 | 6e74 | 205f | 5f72 | 735f | 5f46 | 5238 | 696f | 7374 | 7265 | 616d | 5231 | 3169 | 6f6d | 616e | 6970 | 5f69 | 6e74 |
| 3613720 | 203b | 0069 | 6f61 | 7070 | 6c79 | 5f69 | 6e74 | 3a54 | 2830 | 2c35 | 3829 | 3d73 | 3466 | 6374 | 5f5f | 3131 | 696f | 6170 | 706c | 795f | 696e | 743a | 2830 | 2c35 |
| 3614000 | 3529 | 2c30 | 2c33 | 323b | 3b00 | 696f | 6170 | 706c | 795f | 696e | 743a | 5a63 | 696f | 6170 | 706c | 795f | 696e | 743b | 3b5f | 5f63 | 745f | 5f31 | 3169 | 6f61 |
| 3614060 | 7070 | 6c79 | 5f69 | 6e74 | 4650 | 4652 | 3869 | 6f73 | 7472 | 6561 | 6d69 | 5f52 | 3869 | 6f73 | 7472 | 6561 | 6d20 | 5f5f | 636c | 5f5f | 3131 | 696f | 6170 | 706c |
| 3614140 | 795f | 696e | 7446 | 6920 | 3b3b | 3b00 | 736d | 616e | 6970 | 5f6c | 6f6e | 673a | 5428 | 302c | 3539 | 293d | 7338 | 6663 | 745f | 5f31 | 3173 | 6d61 | 6e69 | 705f |
| 3614220 | 6c6f | 6e67 | 3a28 | 302c | 3432 | 292c | 302c | 3332 | 3b61 | 7267 | 5f5f | 3131 | 736d | 616e | 6970 | 5f6c | 6f6e | 673a | 2830 | 2c31 | 292c | 3332 | 2c33 | 323b |
| 3614300 | 3b00 | 736d | 616e | 6970 | 5f6c | 6f6e | 673a | 5a63 | 736d | 616e | 6970 | 5f6c | 6f6e | 673b | 3b5f | 5f63 | 745f | 5f31 | 3173 | 6d61 | 6e69 | 705f | 6c6f | 6e67 |
| 3614360 | 4650 | 4652 | 3369 | 6f73 | 6c5f | 5233 | 696f | 736c | 203b | 3b5f | 5f6c | 735f | 5f46 | 5237 | 6f73 | 7472 | 6561 | 6d52 | 3131 | 736d | 616e | 6970 | 5f6c | 6f6e |
| 3614440 | 6720 | 5f5f | 7273 | 5f5f | 4652 | 3769 | 7374 | 7265 | 6161 | 5231 | 3173 | 6d61 | 6e69 | 705f | 6c6f | 6e67 | 203b | 0073 | 6170 | 706c | 795f | 6c6f | 6e67 | 3a54 |
| 3614520 | 2930 | 2c36 | 3029 | 3d73 | 3466 | 6374 | 5f5f | 3131 | 7361 | 7070 | 6c79 | 5f6c | 6f6e | 673a | 2830 | 2c34 | 3229 | 2c30 | 2c33 | 323b | 3b00 | 7361 | 7070 | 6c79 |
| 3614600 | 5f6c | 6f6e | 673a | 5a63 | 7361 | 7070 | 6c79 | 5f6c | 6f6e | 673b | 3b5f | 5f63 | 745f | 5f31 | 3173 | 6170 | 706c | 795f | 6c6f | 6e67 | 4650 | 4652 | 3369 | 6f73 |
| 3614660 | 6c5f | 5233 | 696f | 7320 | 5f5f | 636c | 5f5f | 3131 | 7361 | 7070 | 6c79 | 5f6c | 6f6e | 6746 | 6c20 | 3b3b | 3b00 | 696d | 616e | 6970 | 5f6c | 6f6e | 673a | 5428 |
| 3614740 | 302c | 3631 | 293d | 7338 | 6663 | 745f | 5f31 | 3169 | 6d61 | 6e69 | 705f | 6c6f | 6e67 | 3a28 | 302c | 3436 | 292c | 302c | 3332 | 3b61 | 7267 | 5f5f | 3131 | 696d |
| 3615020 | 616e | 6970 | 5f6c | 6f6e | 673a | 2830 | 2c31 | 292c | 3332 | 2c33 | 323b | 3b00 | 696d | 616e | 6970 | 5f6c | 6f6e | 673a | 5a63 | 696d | 616e | 6970 | 5f6c | 6f6e |
| 3615100 | 673b | 3b5f | 5f63 | 745f | 5f31 | 3169 | 6d61 | 6e69 | 705f | 6c6f | 6e67 | 4650 | 4652 | 3769 | 7374 | 7265 | 616d | 6c5f | 5237 | 6973 | 7472 | 6561 | 6d6c | 203b |
| 3615160 | 3b5f | 5f72 | 735f | 5f46 | 5237 | 6973 | 7472 | 6561 | 6d52 | 3131 | 696d | 616e | 6970 | 5f6c | 6f6e | 6720 | 3b00 | 6961 | 7070 | 6c79 | 5f6c | 6f6e | 673a | 5428 |
| 3615240 | 302c | 3632 | 293d | 7334 | 6663 | 745f | 5f31 | 3169 | 6170 | 706c | 795f | 6c6f | 6e67 | 3a28 | 302c | 3436 | 292c | 302c | 3332 | 3b3b | 0069 | 6170 | 706c | 795f |
| 3615320 | 6c6f | 6e67 | 3a5a | 6369 | 6170 | 706c | 795f | 6c6f | 6e67 | 3b3b | 5f5f | 6374 | 5f5f | 3131 | 6961 | 7070 | 6c79 | 5f6c | 6f6e | 6746 | 5046 | 5237 | 6973 | 7472 |

```
3615400 6561 6d6c 5f52 3769 7374 7265 616d 205f 5f63 6c5f 5f31 3169 6170 706c 795f 6c6f 6e67 466c 203b 3b3b 006f 6d61 6e69 705f
3615460 6c6f 6e67 3a54 2830 2c36 3329 3d73 3866 6374 5f5f 3131 6f6d 616e 6970 5f6c 6f6e 673a 2830 2c35 3129 2c30 2c33 323b 6172
3615540 675f 5f31 316f 6d61 6e69 705f 6c6f 6e67 3a28 302c 3129 2c33 322c 3332 3b3b 006f 6d61 6e69 705f 6c6f 6e67 3a5a 636f 6d61
3615620 6e69 705f 6c6f 6e67 3b3b 5f5f 6374 5f5f 3131 6f6d 616e 6970 5f6c 6f6e 6746 5046 5237 6f73 7472 6561 6d6c 5f52 376f 7374
3615700 7265 616d 6c20 3b3b 5f5f 6c73 5f5f 4652 376f 7374 7265 616d 5231 316f 6d61 6e69 705f 6c6f 6e67 203b 006f 6170 706c 795f
3615760 6c6f 6e67 3a54 2830 2c36 3429 3d73 3466 6374 5f5f 3131 6f61 7070 6c79 5f6c 6f6e 673a 2830 2c35 3129 2c30 2c33 323b 3b00
3616040 6f61 7070 6c79 5f6c 6f6e 673a 5a63 6f61 7070 6c79 5f6c 6f6e 673b 3b5f 5f63 745f 5f31 316f 6170 706c 795f 6c6f 6e67 4650
3616120 4652 376f 7374 7265 616d 6c5f 5237 6f73 7472 6561 6d20 5f5f 636c 5f5f 3131 6f61 7070 6c79 5f6c 6f6e 6746 6c20 3b3b 3b00
3616200 696f 6d61 6e69 705f 6c6f 6e67 3a54 2830 2c36 3529 3d73 3866 6374 5f5f 3132 696f 6d61 6e69 705f 6c6f 6e67 3a28 302c 3535
3616260 292c 302c 3332 3b61 7267 5f5f 3132 696f 6d61 6e69 705f 6c6f 6e67 3a28 302c 3129 2c33 322c 3332 3b3b 0069 6f6d 616e 6970
3616340 5f6c 6f6e 673a 5a63 696f 6d61 6e69 705f 6c6f 6e67 3b3b 5f5f 6374 5f5f 3132 696f 6d61 6e69 705f 6c6f 6e67 4650 4652 3869
3616420 6f73 7472 6561 6d6c 5f52 3869 6f73 7472 6561 6d6c 203b 3b5f 5f6c 735f 5f46 5238 696f 7374 7265 616d 5231 3269 6f6d 616e
3616500 6970 5f6c 6f6e 6720 5f5f 7273 5f5f 4652 3869 6f73 7472 6561 6d52 3132 696f 6d61 6e69 705f 6c6f 6e67 203b 0069 6f61 7070
3616560 6c79 5f6c 6f6e 673a 5428 302c 3636 293d 7334 6563 745f 5f31 3269 6f61 7070 6c79 5f6c 6f6e 673a 2830 2c35 3529 2c30 2c33
3616640 323b 3b00 696f 6170 706c 795f 6c6f 6e67 3a5a 6369 6f61 7070 6c79 5f6c 6f6e 673b 3b5f 5f63 745f 5f31 3269 6f61 7070 6c79
3616720 5f6c 6f6e 6746 5046 5238 696f 7374 7265 616d 6c5f 5238 696f 7374 7265 616d 205f 5f63 6c5f 5f31 3269 6f61 7070 6c79 5f6c
3617000 6f6e 6746 6c20 3b3b 3b00 7374 6469 6f62 7566 3a54 2830 2c36 3729 3d73 3532 616c 6c6f 635f 5f39 7374 7265 616d 6275 663a
3617060 2830 2c34 292c 302c 3136 3b78 5f75 6e62 7566 5f5f 3973 7472 6561 6d62 7566 3a28 302c 3429 2c31 362c 3136 3b78 5f62 6173
3617140 655f 5f39 7374 7265 616d 6275 663a 2830 2c32 3029 2c33 322c 3332 3b78 5f70 6261 7365 5f5f 3973 7472 6561 6d62 7566 3a28
3617220 302c 3230 292c 3634 2c33 323b 785f 7070 7472 5f5f 3973 7472 6561 6d62 7566 3a28 302c 3230 292c 3936 2c33 323b 785f 6570
3617300 7074 725f 5f39 7374 7265 616d 6275 663a 2830 2c32 3029 2c31 3238 2c33 323b 785f 6770 7472 5f5f 3973 7472 6561 6d62 7566
3617360 3a28 302c 3230 292c 3136 302c 3332 3b78 5f65 6770 7472 5f5f 3973 7472 6561 6d62 7566 3a28 302c 3230 292c 3139 322c 3332
3617440 3b5c 0078 5f65 6261 636b 5f5f 3973 7472 6561 6d62 7566 3a28 302c 3230 292c 3232 342c 3332 3b78 5f62 6c65 6e5f 5f39 7374
3617520 7265 616d 6275 663a 2830 2c31 292c 3235 362c 3332 3b5f 5f76 7374 725f 5f39 7374 7265 616d 6275 663a 2830 2c33 3329 2c32
3617600 3038 2c33 323b 6670 5f5f 3973 7464 696f 6275 663a 2830 2c36 3829 3d2a 2830 2c31 3829 3d78 735f 696f 6275 663a 2c33 3230
3617660 2c33 323b 6c61 7374 5f6f 705f 5f38 7374 6469 6f62 7566 3a28 302c 3129 2c33 3532 2c33 323b 6275 665f 5f38 7374 6469 6f62
3617740 7566 3a28 302c 3639 293d 6172 2830 2c31 293b 303b 313b 2830 2c32 292c 3338 342c 3136 3b3b 0073 7464 696f 6275 663a 5a63
3620020 7374 6469 6f62 7566 3b73 7472 6561 6d62 7566 3b6f 7665 7266 6c6f 775f 5f38 7374 6469 6f62 7566 4669 2075 6e64 6572 666c
3620100 6f77 5f5f 3873 7464 696f 6275 6646 7620 7379 6e63 5f5f 3873 7464 696f 6275 6646 7620 7365 656b 6f66 665f 5f38 7374 6469
3620160 6f62 7566 466c 3873 6565 6b5f 6469 7269 2070 6261 636b 6661 696c 5f5f 3873 7464 696f 6275 6646 6920 5f5f 6374 5f5f 3873
3620240 7464 696f 6275 6646 5036 5f69 6f62 7566 205f 5f63 745f 5f38 7374 6469 6f62 7566 4652 4338 7374 6469 6f62 7566 205c 0073
3620320 7464 696f 6669 6c65 5f5f 3873 7464 696f 6275 6646 7620 5f5f 6474 5f5f 3873 7464 696f 6275 6646 7620 3b3b 3b00 6669 6c65
3620400 6275 663a 5428 302c 3730 293d 7336 3461 6c6c 6f63 5f5f 3973 7472 6561 6d62 7566 3a28 302c 3429 2c30 2c31 363b 785f 756e
3620460 6275 665f 5f39 7374 7265 616d 6275 663a 2830 2c34 292c 3136 2c31 363b 785f 6261 7365 5f5f 3973 7472 6561 6d62 7566 3a28
3620540 302c 3230 292c 3332 2c33 323b 735f 7062 6173 655f 5f39 7374 7265 616d 6275 663a 2830 2c32 3029 2c36 342c 3332 3b78 5f70
3620620 7074 725f 5f39 7374 7265 616d 6275 663a 2830 2c32 3029 2c39 362c 3332 3b78 5f65 7070 7472 5f5f 3973 7472 6561 6d62 7566
3620700 3a28 302c 3230 292c 3132 382c 3332 3b78 5f67 7074 725f 5f39 7374 7265 616d 6275 663a 2830 2c32 3029 2c31 3630 2c33 323b
3620760 785f 6567 7074 725f 5f39 7374 7265 616d 6275 663a 2830 2c32 3029 2c31 3932 2c33 323b 5c00 785f 6562 6163 6b5f 5f39 7374
3621040 7265 616d 6275 663a 2830 2c32 3029 2c32 3234 2c33 323b 785f 626c 656e 5f5f 3973 7472 6561 6d62 7566 3a28 302c 3129 2c32
3621120 3536 2c33 323b 5f5f 7670 7472 5f5f 3973 7472 6561 6d62 7566 3a28 302c 3333 292c 3238 382c 3332 3b78 6664 5f5f 3766 696c
3621200 6562 7566 3a28 302c 3129 2c33 3230 2c33 323b 6d6f 6465 5f5f 3766 696c 6562 7566 3a28 302c 3129 2c33 3532 2c33 323b 6f70
3621260 656e 6564 5f5f 3766 696c 6562 7566 3a28 302c 3229 2c33 3834 2c38 3b6c 6173 745f 7365 656b 5f5f 3766 696c 6562 7566 3a28
3621340 302c 3129 2c34 3136 2c33 323b 696e 5f73 7461 7274 5f5f 3766 696c 6562 7566 3a28 302c 3230 292c 3434 382c 3332 3b6c 6168
3621420 6561 645f 5f37 6669 6c65 6275 663a 2830 2c36 3929 2c34 3830 2c31 363b 3b00 6f70 656e 7072 6f74 5f5f 3766 696c 6562 7566
3621500 3a47 2830 2c31 2900 6669 6c65 6275 663a 5a63 6669 6c65 6275 663b 7374 7265 616d 6275 663b 5f5f 6374 5f5f 3766 696c 6562
3621560 7566 4676 205f 5f63 745f 5f37 6669 6c65 6275 6646 6920 5f5f 6374 5f5f 3766 696c 6562 7566 4669 5063 5431 205f 5f63 745f
3621640 5f37 6669 6c65 6275 6646 5243 3766 696c 6562 7566 2069 735f 6f70 656e 5f5f 3766 696c 6562 7566 4676 2066 645f 5f37 6669
3621720 6c65 6275 6646 7620 6f70 656e 5f5f 3766 696c 6562 7566 4650 4363 6954 3220 6174 7461 6368 5f5f 3766 696c 6562 7566 4669
3622000 2063 6c6f 7365 5f5f 3766 696c 6562 7566 4676 205c 005f 5f64 745f 5f37 6669 6c65 6275 6646 7620 6f76 6572 666c 6f77 5f5f
3622060 3766 696c 6562 7566 4669 2075 6e64 6572 666c 6f77 5f5f 3766 696c 6562 7566 4676 2073 796e 635f 5f37 6669 6c65 6275 6646
3622140 7620 7365 656b 6f66 665f 5f37 6669 6c65 6275 6646 6c38 7365 656b 5f64 6972 6920 7365 7462 7566 5f5f 3766 696c 6562 7566
3622220 4650 6369 206c 6173 745f 6f70 5f5f 3766 696c 6562 7566 4676 203b 6f70 656e 7072 6f74 5f5f 3766 696c 6562 7566 203b 3b00
3622300 6673 7472 6561 6d62 6173 653a 5428 302c 3731 293d 7331 3332 6275 665f 5f31 3166 7374 7265 616d 6261 7365 3a28 302c 3730
3622360 292c 302c 3531 323b 5f5f 7670 7472 5f5f 3131 6673 7472 6561 6d62 6173 653a 2830 2c33 3329 2c35 3132 2c33 323b 5069 6f73
3622440 3a28 302c 3335 292c 3534 342c 3332 3b4f 696f 733a 2830 2c32 3629 2c35 3736 2c34 3830 3b3b 0066 7374 7265 616d 6261 7365
```

```
3622520  3a5a 6366 7374 7265 616d 6261 7365 3b69 6f73 3b5f 5f63 745f 5f31 3166 7374 7265 616d 6261 7365 4676 205f 5f63 745f 5f31
3622600  3166 7374 7265 616d 6261 7365 4650 4363 6954 3220 5f5f 6374 5f5f 3131 6673 7472 6561 6d62 6173 6546 6920 5f5f 6374 5f5f
3622660  3131 6673 7472 6561 6d62 6173 6546 6950 6354 3120 5f5f 6374 5f5f 3131 6673 7472 6561 6d62 6173 6546 5231 3166 7374 7265
3622740  616d 6261 7365 205f 5f64 745f 5f31 3166 7374 7265 616d 6261 7365 4676 206f 7065 6e5f 5f31 3166 7374 7265 616d 6261 7365
3623020  4650 4363 6954 3220 5c00 6174 7461 6368 5f5f 3131 6673 7472 6561 6d62 6173 6546 6920 636c 6f73 655f 5f31 3166 7374 7265
3623100  616d 6261 7365 4676 2073 6574 6275 665f 5f31 3166 7374 7265 616d 6261 7365 4650 6369 2072 6462 7566 5f5f 3131 6673 7472
3623160  6561 6d62 6173 6546 7620 7665 7269 6679 5f5f 3131 6673 7472 6561 6d62 6173 6546 6920 3b3b 3b00 7374 6174 655f 7661 6c75
3623240  653a 7428 302c 3231 2900 5661 6c75 655f 5479 7065 3a54 2830 2c37 3229 3d65 554e 4b4e 4f57 4e56 3a30 2c53 5452 494e 473a
3623320  312c 494e 5445 4745 523a 322c 464c 4f41 543a 332c 3b00 426c 6f63 6b5f 5479 7065 3a54 2830 2c37 3329 3d65 554e 4b4e 4f57
3623400  4e42 3a30 2c45 4e54 4954 593a 312c 4655 4e43 5449 4f4e 3a32 2c50 524f 4345 4455 5245 3a33 2c3b 0045 6e74 6974 795f 5479
3623460  7065 3a54 2830 2c37 3429 3d65 554e 4b4e 4f57 4e45 3a30 2c41 5243 4849 5445 4354 5552 453a 312c 5355 4250 524f 4752 414d
3623540  3a32 2c3b 0050 696e 5f54 7970 653a 5428 302c 3735 293d 6555 4e4b 4e4f 574e 503a 302c 494e 5049 4e3a 312c 4f55 5450 494e
3623620  3a32 2c49 4e4f 5554 5049 4e3a 332c 3b00 5061 7261 5f43 6c61 7373 3a54 2830 2c37 3629 3d65 554e 4b4e 4f57 4e43 3a30 2c46
3623700  4f52 4341 4c3a 312c 4143 5455 414c 3a32 2c52 4553 4f4c 5645 443a 332c 3b00 424f 4f4c 4541 4e3a 5428 302c 3737 293d 6546
3623760  616c 7365 3a30 2c54 7275 653a 312c 3b00 426f 6f6c 6561 6e3a 5428 302c 3738 293d 6566 616c 7365 3a30 2c74 7275 653a 312c
3624040  3b00 4275 6666 6572 3a47 2830 2c32 3029 004f 626a 6563 743a 5428 302c 3739 293d 7334 5f5f 7670 7472 5f5f 364f 626a 6563
3624120  743a 2830 2c33 3329 2c30 2c33 323b 3b00 4f62 6a65 6374 3a5a 634f 626a 6563 743b 3b5f 5f63 745f 5f36 4f62 6a65 6374 4676
3624200  205f 5f63 745f 5f36 4f62 6a65 6374 4652 4336 4f62 6a65 6374 2065 7272 6f72 4d65 6d6f 7279 5f5f 364f 626a 6563 7446 5063
3624260  5431 2065 7870 6c61 696e 5f5f 364f 626a 6563 7446 5063 2069 6e4f 7264 6572 5f5f 364f 626a 6563 7446 5036 4f62 6a65 6374
3624340  203b 3b3b 005f 5f70 7462 6c5f 5f36 4f62 6a65 6374 5f5f 436f 756e 7465 725f 6378 783a 4728 302c 3333 2900 5046 3a74 2830
3624420  2c31 3529 0050 4643 3a74 2830 2c31 3529 0050 4649 3a74 2830 2c31 3529 004e 4f62 6a65 6374 3a54 2830 2c38 3029 3d73 385f
3624500  5f76 7074 725f 5f36 4f62 6a65 6374 3a28 302c 3333 292c 302c 3332 3b6e 616d 655f 5f37 4e4f 626a 6563 743a 2830 2c32 3029
3624560  2c33 322c 3332 3b3b 004e 4f62 6a65 6374 3a5a 634e 4f62 6a65 6374 3b4f 626a 6563 743b 5f5f 6374 5f5f 374e 4f62 6a65 6374
3624640  4650 6320 5f5f 6374 5f5f 374e 4f62 6a65 6374 4652 4337 4e4f 626a 6563 7420 7365 744e 616d 655f 5f37 4e4f 626a 6563 7446
3624720  5063 2067 6574 4e61 6d65 5f5f 374e 4f62 6a65 6374 4676 2065 7870 6c61 696e 5f5f 374e 4f62 6a65 6374 4650 6320 6765 7441
3625000  7474 725f 5f37 4e4f 626a 6563 7446 6920 6765 7450 726f 705f 5f37 4e4f 626a 6563 7446 5063 6920 7365 7450 726f 705f 5f37
3625060  4e4f 626a 6563 7446 5063 5431 205c 0073 5574 5072 6f70 5f5f 374e 4f62 6a65 6374 4650 6369 2073 6574 5072 6f70 5f5f 374e
3625140  4f62 6a65 6374 4650 6366 2069 7347 5445 5f5f 374e 4f62 6a65 6374 4650 364f 626a 6563 7420 6973 4c54 455f 5f37 4e4f 626a
3625220  6563 7446 5036 4f62 6a65 6374 203b 3b3b 006f 7374 7265 616d 5f77 6974 6861 7373 6967 6e3a 5428 302c 3339 293d 7336 385f
3625300  5f76 7074 725f 5f37 6f73 7472 6561 6d3a 2830 2c33 3329 2c30 2c33 323b 5069 6f73 3a28 302c 3335 292c 3332 2c33 323b 4f69
3625360  6f73 3a28 302c 3236 292c 3634 2c34 3830 3b3b 006f 7374 7265 616d 5f77 6974 6861 7373 6967 6e3a 5a63 6f73 7472 6561 6d5f
3625440  7769 7468 6173 7369 676e 3b6f 7374 7265 616d 2069 6f73 3b5f 5f63 745f 5f31 386f 7374 7265 616d 5f77 6974 6861 7373 6967
3625520  6e46 7620 5f5f 6374 5f5f 3138 6f73 7472 6561 615f 7769 7468 6173 7369 676e 4652 3138 6f73 7472 6561 6d5f 7769 7468 6173
3625600  7369 676e 205f 5f64 745f 5f31 386f 7374 7265 616d 5f77 6974 6861 7373 6967 6e46 7620 5f5f 6173 5f5f 3138 6f73 7472 6561
3625660  6d5f 7769 7468 6173 7369 676e 4652 376f 7374 7265 616d 205c 005f 5f61 735f 5f31 386f 7374 7265 616d 5f77 6974 6861 7373
3625740  6967 6e46 5C39 7374 7265 6163 6275 6620 3b3b 3b00 5046 423a 7428 302c 3135 2900 4c4e 4f62 6a65 6374 3a54 2830 2c38 3129
3626020  3d73 3132 5f5f 7670 7472 5f5f 364f 626a 6563 743a 2830 2c33 3329 2c30 2c33 323b 6e61 6d65 5f5f 374e 4f62 6a65 6374 3a28
3626100  302c 3230 292c 3332 2c33 323b 6e65 7874 5f5f 384c 4e4f 626a 6563 743a 2830 2c38 3229 3d2a 2830 2c38 3129 2c36 342c 3332
3626160  3b3b 004c 4e4f 626a 6563 743a 5a63 4c4e 4f62 6a65 6374 3b4e 4f62 6a65 6374 3b5f 5f63 745f 5f38 4c4e 4f62 6a65 6374 4650
3626240  6350 384c 4e4f 626a 6563 7420 5f5f 6374 5f5f 384c 4e4f 626a 6563 7446 5243 384c 4e4f 626a 6563 7420 7365 744e 6578 745f
3626320  5f38 4c4e 4f62 6a65 6374 4650 384c 4e4f 626a 6563 7420 6765 744e 6578 745f 5f38 4c4e 4f62 6a65 6374 4676 203b 3b3b 004c
3626400  4f62 6a65 6374 3a54 2830 2c38 3329 3d73 385f 5f76 7074 725f 5f36 4f62 6a65 6374 3a28 302c 3333 292c 302c 3332 3b6e 6578
3626460  745f 5f37 4c4f 626a 6563 743a 2830 2c38 3429 3d2a 2830 2c38 3329 2c33 322c 3332 3b3b 004c 4f62 6a65 6374 3a5a 634c 4f62
3626540  6a65 6374 3b4f 626a 6563 743b 5f5f 6374 5f5f 374c 4f62 6a65 6374 4650 374c 4f62 6a65 6374 205f 5f63 745f 5f37 4c4f 626a
3626620  6563 7446 5243 374c 4f62 6a65 6374 2073 6574 4e65 7874 5f5f 374c 4f62 6a65 6374 4650 374c 4f62 6a65 6374 2067 6574 4e65
3626700  7874 5f5f 374c 4f62 6a65 6374 4676 203b 3b3b 004c 504f 626a 6563 743a 5428 302c 3835 2931 7331 325f 5f76 7074 725f 5f36
3626760  4f62 6a65 6374 3a28 302c 3333 292c 302c 3332 3b6e 6578 745f 5f37 4c4f 626a 6563 743a 2830 2c38 3429 2c33 322c 3332 3b6e
3627040  6f62 6a70 7472 5f5f 384c 504f 626a 6563 743a 2830 2c38 3629 3d2a 2830 2c38 3029 2c36 342c 3332 3b3b 004c 504f 626a 6563
3627120  743a 5a63 4c50 4f62 6a65 6374 3b4c 4f62 6a65 6374 3b5f 5f63 745f 5f38 4c50 4f62 6a65 6374 4650 374e 4f62 6a65 6374 5037
3627200  4c4f 626a 6563 7420 5f5f 6374 5f5f 384c 504f 626a 6563 7446 5243 384c 504f 626a 6563 7420 7365 744f 626a 6563 745f 5f38
3627260  4c50 4f62 6a65 6374 4650 374e 4f62 6a65 6374 2067 6574 4f62 6a65 6374 5f5f 384c 504f 626a 6563 7446 7620 6578 706c 6169
3627340  6e5f 5f38 4c50 4f62 6a65 6374 4650 632C 3b3b 3b00 5f5f 7074 626c 5f5f 384c 504f 626a 6563 745f 5f43 6f75 6e74 6572 5f63
3627420  7878 3a47 2830 2c33 3329 004c 6973 743a 5428 302c 3837 293d 7331 3263 6f75 6e74 5f5f 344c 6973 743a 2830 2c31 292c 302c
3627500  3332 3b70 7472 4c4f 626a 6563 745f 5f34 4c69 7374 3a28 302c 3834 292c 3332 2c33 323b 5f5f 7670 7472 5f5f 344c 6973 743a
3627560  2830 2c33 3329 2c36 342c 3332 3b3b 004c 6973 743a 5a63 4c69 7374 3b3b 5f5f 6374 5f5f 344c 6973 7446 7620 5f5f 6374 5f5f
```

```
3627640 344c 6973 7446 5243 344c 6973 7420 5f5f 6474 5f5f 344c 6973 7446 7620 6765 7443 6f75 6e74 5f5f 344c 6973 7446 762c 6765
3627720 7454 6f70 5f5f 344c 6973 7446 7620 7365 7454 6f70 5f5f 344c 6973 7446 5037 4c4f 626a 6563 7420 6572 726f 724d 656d 6f72
3630000 795f 5f34 4c69 7374 4650 6354 3120 6272 6f61 6463 6173 745f 5f34 4c69 7374 464d 364f 626a 6563 7446 765f 7620 6578 706c
3630060 6169 6e5f 5f34 4c69 7374 4650 6320 5c00 696e 7365 7274 5f5f 344c 6973 7446 5037 4c4f 626a 6563 7420 6973 4d65 6d62 6572
3630140 5f5f 344c 6973 7446 5037 4c4f 626a 6563 7420 6973 4d65 6d62 6572 5f5f 344c 6973 7446 5063 2069 7345 7175 616c 5f5f 344c
3630220 6973 7446 5234 4c69 7374 2072 656d 6f76 655f 5f34 4c69 7374 4650 6320 3b3b 3b00 5f5f 7074 626c 5f5f 344c 6973 745f 5f43
3630300 6f75 6e74 6572 5f63 7878 3a47 2830 2c33 3329 0050 4c69 7374 3a54 2830 2c38 3829 3d73 3132 636f 756e 745f 5f34 4c69 7374
3630360 3a28 302c 3129 2c30 2c33 323b 7074 724c 4f62 6a65 6374 5f5f 344c 6973 743a 2830 2c38 3429 2c33 322c 3132 3b5f 5f76 7074
3630440 725f 5f34 4c69 7374 3a28 302c 3333 292c 3634 2c33 323b 3b00 504c 6973 743a 5a63 504c 6973 743b 4c69 7374 3b69 6e73 6572
3630520 745f 5f35 504c 6973 7446 5038 4c50 4f62 6a65 6374 2069 6e73 6572 745f 5f35 504c 6973 7446 5235 504c 6973 7420 536f 7274
3630600 5f50 4c69 7374 5f5f 3550 4c69 7374 4669 2072 6576 6572 7365 5f5f 3550 4c69 7374 4676 2069 6e73 6572 7441 6674 6572 5f5f
3630660 3550 4c69 7374 4650 384c 504f 626a 6563 7454 3120 7265 6d6f 7665 5f5f 3550 4c69 7374 4650 384c 504f 626a 6563 7420 7265
3630740 6d6f 7665 5f5f 3550 4c69 7374 4650 6320 5973 4d65 6d62 6572 5f5f 3550 4c69 7374 4650 6320 5c00 6973 4d65 6d62 6572 5f5f
3631020 3550 4c69 7374 4650 374c 4f62 6a65 6374 2069 7345 7175 616c 5f5f 3550 4c69 7374 4652 344c 6973 7420 6578 706c 6169 6e5f
3631100 5f35 504c 6973 7446 5063 205f 5f63 745f 5f35 504c 6973 7446 5243 3550 4c69 7374 205f 5f63 745f 5f35 504c 6973 7446 7620
3631160 3b3b 3b00 5f5f 7074 626c 5f5f 3550 4c69 7374 5f5f 436f 756e 7465 725f 6378 783a 4728 302c 3333 2900 4c69 7374 4974 6572
3631240 6174 6f72 3a54 2830 2c38 3929 3d73 386c 6973 745f 5f31 324c 6973 7449 7465 7261 746f 723a 2830 2c39 3029 3d2a 2830 2c38
3631320 3729 2c30 2c33 323b 705f 5f31 324c 6973 7449 7465 7261 746f 723a 2830 2c38 3429 2c33 322c 3332 3b3b 004c 6973 7449 7465
3631400 7261 746f 723a 5a63 4c69 7374 4974 6572 6174 6f72 3b3b 5f5f 6374 5f5f 3132 4c69 7374 4974 6572 6174 6f72 4652 344c 6973
3631460 7420 7265 7365 745f 5f31 324c 6973 7449 7465 7261 746f 7246 7620 6174 7461 6368 5f5f 3132 4c69 7374 4974 6572 6174 6f72
3631540 4652 344c 6973 7420 6765 7443 7572 7265 6e74 5f5f 3132 4c69 7374 4974 6572 6174 6f72 4676 205f 5f70 705f 5f31 324c 6973
3631620 7449 7465 7261 746f 7246 7620 3b3b 3b00 5069 6e4c 656e 6774 683a 5428 302c 3931 293d 7331 365f 5f76 7074 725f 5f36 4f62
3631700 6a65 6374 3a28 302c 3333 292c 302c 3332 3b6e 616d 655f 5f37 4e4f 626a 6563 743a 2830 2c32 3029 2c33 322c 3332 3b43 6c65
3631760 6e67 7468 5f5f 3950 696e 4c65 6e67 7468 3a28 302c 3230 292c 3634 2c33 323b 496c 656e 6774 685f 5f39 5069 6e4c 656e 6774
3632040 683a 2830 2c31 292c 3936 2c33 323b 3b00 5069 6e4c 656e 6774 683a 5a63 5069 6e4c 656e 6774 683b 4e4f 626a 6563 743b 5f5f
3632120 6374 5f5f 3950 696e 4c65 6e67 7468 4650 6354 3120 5f5f 6374 5f5f 3950 696e 4c65 6e67 7468 4652 4339 5069 6e4c 656e 6774
3632200 6820 7365 745f 5069 6e4c 656e 6774 685f 5f39 5069 6e4c 656e 6774 6846 5063 5431 2067 6574 5f49 5f50 696e 4c65 6e67 7468
3632260 5f5f 3950 696e 4c65 6e67 7468 4676 2067 6574 5f49 5f50 696e 4c65 6e67 7468 5f5f 3950 696e 4c65 6e67 7468 4669 203b 3b3b
3632340 004d 6f64 4765 6e3a 5428 302c 3332 293d 7332 3442 6974 5769 6474 685f 5f36 4d6f 6447 656e 3a28 302c 3129 2c30 2c33 323b
3632420 4553 7461 7465 5f5f 364d 6f64 4765 6e3a 2830 2c37 3829 2c33 322c 3332 3b50 696e 4e61 6d65 4c65 6e67 7468 5f5f 364d 6f64
3632500 4765 6e3a 2830 2c38 3829 2c36 342c 3936 3b5f 5f76 7074 725f 5f36 4d6f 6447 656e 3a28 302c 3333 292c 3136 302c 3332 3b3b
3632560 004d 6f64 4765 6e3a 5a63 4d6f 6447 656e 3b3b 5f5f 6374 5f5f 364d 6f64 4765 6e46 7620 5f5f 6374 5f5f 364d 6f64 4765 6e46
3632640 5243 364d 6f64 4765 6e20 7365 745f 4269 7457 6964 7468 5f5f 364d 6f64 4765 6e46 6920 7365 745f 4553 7461 7465 5f5f 364d
3632720 6f64 4765 6e46 3742 6f6f 6c65 616e 2067 6574 5f45 5374 6174 655f 5f36 4d6f 6447 656e 4676 2073 6574 5f50 696e 4c65 6e67
3633000 7468 5f5f 364d 6f64 4765 6e46 5063 5431 2067 6574 5f50 696e 4c65 6e67 7468 5f5f 364d 6f64 4765 6e46 5063 2073 6574 496e
3633060 6465 785f 5f36 4d6f 6447 656e 4676 205c 0073 6574 4e61 6d65 496e 6465 785f 5f36 4d6f 6447 656e 4650 6320 4c6f 6164 5f56
3633140 4844 4c5f 4461 7461 5f5f 364d 6f64 4765 6e46 5037 4e4f 626a 6563 7420 436f 6d70 6f73 655f 4d6f 6447 656e 5f44 6573 6372
3633220 6970 746f 725f 5f36 4d6f 6447 656e 4650 6320 6578 706c 6169 6e5f 5f36 4d6f 6447 656e 4676 205f 5f64 745f 5f36 4d6f 6447
3633300 656e 4676 203b 3b3b 005f 5f70 7462 6c5f 5f36 4d6f 6447 656e 5f5f 436f 756e 7465 725f 6378 783a 4728 302c 3333 2900 494f
3633360 5f4d 616e 6167 6572 3a54 2830 2c39 3329 3d73 3336 6966 705f 5f31 3049 4f5f 4d61 6e61 6765 723a 2830 2c36 3829 2c30 2c33
3633440 323b 6f66 705f 5f31 3049 4f5f 4d61 6e61 6765 723a 2830 2c36 3829 2c33 322c 3332 3b6d 6670 5f5f 3130 494f 5f4d 616e 6167
3633520 6572 3a28 302c 3538 292c 3634 2c33 323b 6366 705f 5f31 3049 4f5f 4d61 6e61 6765 723a 2830 2c36 3829 2c39 362c 3332 3b49
3633600 4669 6c65 4e61 6d65 5f5f 3130 494f 5f4d 616e 6167 6572 3a28 302c 3230 292c 3132 382c 3332 3b4f 4669 6c65 4e61 6d65 5f5f
3633660 3130 494f 5f4d 616e 6167 6572 3a28 302c 3230 292c 3136 302c 3332 3b4d 4669 6c65 4e61 6d65 5f5f 3130 494f 5f4d 616e 6167
3633740 6572 3a28 302c 3230 292c 3139 322c 3332 3b43 4669 6c65 4e61 6465 5f5f 3130 494f 5f4d 616e 6167 6572 3a28 302c 3230 292c
3634020 3232 342c 3332 3b63 754c 696e 655f 5f31 3049 4f5f 4d61 6e61 6765 723a 2830 2c31 292c 3235 362c 3332 3b3b 0049 4f5f 4d61
3634100 6e61 6765 723a 5a63 494f 5f4d 616e 6167 6572 3b3b 5f5f 6374 5f5f 3130 494f 5f4d 616e 6167 6572 4650 6320 5f5f 6474 5f5f
3634160 3130 494f 5f4d 616e 6167 6572 4676 2049 4f43 6865 636b 5f5f 3130 494f 5f4d 616e 6167 6572 4676 2043 6f70 7946 696c 6554
3634240 6f4c 696e 655f 5f31 3049 4f5f 4d61 6e61 6765 7246 6920 436f 7079 4669 6c65 546f 456e 645f 5f31 3049 4f5f 4d61 6e61 6765
3634320 7246 7620 5374 6174 6d65 6e74 4861 6e64 656c 6572 5f5f 3130 494f 5f4d 616e 6167 6572 4650 6354 3169 205c 0043 6f70 7946
3634400 696c 6554 6f4b 6579 575f 5f31 3049 4f5f 4d61 6e61 6765 7246 5063 5431 2045 6174 5f53 7461 7465 6d65 6e74 5f5f 3130 494f
3634460 5f4d 616e 6167 6572 4650 6354 3120 575f 4f75 7446 696c 655f 5f31 3049 4f5f 4d61 6e61 6765 7246 5063 2057 5f4d 4669 6c65
3634540 5f5f 3130 494f 5f4d 616e 6167 6572 4650 6320 575f 4346 696c 655f 5f31 3049 4f5f 4d61 6e61 6765 7246 5063 203b 3b3b 005f
3634620 5f43 3535 3a54 2830 2c39 3429 3375 3473 7661 6c75 653a 2830 2c32 3029 2c30 2c33 323b 6976 616c 7565 3a28 302c 3129 2c30
3634700 2c33 323b 6676 616c 7565 3a28 302c 3929 2c30 2c33 323b 3b00 5f5f 4335 353a 5a63 5f5f 4335 353b 3b3b 3b3b 0047 656e 5661
```

```
3634760 6c75 653a 5428 302c 3935 2931 7331 365f 5f76 7074 725f 5f36 4f62 6a65 6374 3a28 302c 3333 292c 302c 3332 3b6e 616d 655f
3635040 5f37 4e4f 626a 6563 743a 2830 2c32 3029 2c33 322c 3332 3b74 7970 655f 5f38 4765 6e56 616c 7565 3a28 302c 3732 292c 3634
3635120 2c33 323b 5f5f 4f35 355f 5f38 4765 6e56 616c 7565 3a28 302c 3934 292c 3936 2c33 323b 3b00 4765 6e56 616c 7565 3a5a 6347
3635200 656e 5661 6c75 653b 4e4f 626a 6563 743b 5f5f 6374 5f5f 3847 656e 5661 6c75 6546 7620 5f5f 6374 5f5f 3847 656e 5661 6c75
3635260 6546 5243 3847 656e 5661 6c75 6520 5f5f 6474 5f5f 3847 656e 5661 6c75 6546 7620 7365 745f 4765 6e56 616c 7565 5f74 7970
3635340 655f 5f38 4765 6e56 616c 7565 4650 6369 2073 6574 5f47 656e 5661 6c75 655f 7479 7065 5f5f 3847 656e 5661 6c75 6546 3130
3635420 5661 6c75 655f 5479 7065 2073 6574 5f47 656e 5661 6c75 655f 5f38 4765 6e56 616c 7565 4650 6320 5c00 7365 745f 4765 6e56
3635500 616c 7565 5f5f 3847 656e 5661 6c75 6546 5920 7365 745f 4765 6e56 616c 7565 5f5f 3847 656e 5661 6c75 6546 6620 6765 745f
3635560 4765 6e56 616c 7565 5f74 7970 655f 5f38 4765 6e56 616c 7565 4676 2067 6574 5f47 656e 5661 6c75 655f 735f 5f38 4765 6e56
3635640 616c 7565 4676 2067 6574 5f47 656e 5661 6c75 655f 695f 5f38 4765 6e56 616c 7565 4676 2067 6574 5f47 656e 5661 6c75 655f
3635720 665f 5f38 4765 6e56 616c 7565 4676 2065 7870 6c61 696e 5f5f 3847 656e 5661 6c75 6546 5063 205c 0063 6865 636b 5f5f 3847
3636000 656e 5661 6c75 6546 6920 3b3b 3b00 5f5f 7074 626c 5f5f 3847 656e 5661 6c75 655f 5f43 6f75 6e74 6572 5f63 7878 3a47 2830
3636060 2c33 3329 0070 6172 616d 6574 6572 3a54 2830 2c39 3629 3d73 3630 5f5f 7670 7472 5f5f 364f 626a 6563 743a 2830 2c33 3329
3636140 2c30 2c33 323b 6e61 6d65 5f5f 374e 4f62 6a65 6374 3a28 302c 3230 292c 3332 2c33 323b 6e61 6d65 5f5f 3970 6172 616d 6574
3636220 6572 3a28 302c 3230 292c 3634 2c33 323b 7479 7065 5f5f 3970 6172 616d 6574 6572 3a28 302c 3230 292c 3936 2c33 323b 7261
3636300 6e67 655f 5f39 7061 7261 6d65 7465 723a 2830 2c32 3029 2c31 3238 2c33 323b 736c 6963 655f 5f39 7061 7261 6d65 7465 723a
3636360 2830 2c32 3029 2c31 3630 2c33 323b 536c 6f77 5f5f 3970 6172 616d 6574 6572 3a28 302c 3129 2c31 3932 2c33 323b 5368 6967
3636440 695f 5f39 7061 7261 6d65 7465 723a 2830 2c31 292c 3232 342c 3332 3b5c 0050 436c 6173 735f 5f39 7061 7261 6d65 7465 723a
3636520 2830 2c37 3629 2c32 3536 2c33 323b 5058 5265 665f 5f39 7061 7261 6d65 7465 723a 2830 2c39 3729 3d2a 2830 2c39 3629 2c32
3636600 3838 2c33 323b 6d6f 6465 5f5f 3970 6172 616d 6574 6572 3a28 302c 3735 292c 3332 302c 3332 3b76 616c 7565 5f5f 3970 6172
3636660 616d 6574 6572 3a28 302c 3935 292c 3335 322c 3132 393b 3b00 7061 7261 6d65 7465 723a 5a63 7061 7261 6d65 7465 723b 4e4f
3636740 626a 6563 743b 5f5f 6374 5f5f 3970 6172 616d 6574 6572 4676 205f 5f63 745f 5f39 7061 7261 6d65 7465 7246 5243 3970 6172
3637020 616d 6574 6572 205f 5f64 745f 5f39 7061 7261 6d65 7465 7246 7620 6765 745f 7061 7261 6d65 7465 725f 6d6f 6465 5f5f 3970
3637100 6172 616d 6574 6572 4676 2067 6574 5f70 6172 616d 6574 6572 5f63 6c61 7373 5f5f 3970 6172 616d 6574 6572 4676 2067 6574
3637160 5f70 6172 615f 736c 6f77 5f5f 3970 6172 616d 6574 6572 4676 205c 0067 6574 5f70 6172 615f 7368 6967 685f 5f39 7061 7261
3637240 6d65 7465 7246 7620 6765 745f 7061 7261 6d65 7465 725f 7261 6e67 655f 5f39 7061 7261 6d65 7465 7246 7620 6765 745f 7061
3637320 7261 6d65 7465 725f 7479 7065 5f5f 3970 6172 616d 6574 6572 4676 2067 6574 5f70 6172 616d 6574 6572 5f6e 616d 655f 5f39
3637400 7061 7261 6d65 7465 7246 7620 6765 745f 7061 7261 6d65 7465 725f 736c 6963 655f 5f39 7061 7261 6d65 7465 7246 7620 6765
3637460 745f 7061 7261 6d65 7465 725f 5058 5245 465f 5f39 7061 7261 6d65 7465 7246 3130 5061 7261 5f43 6c61 7373 205c 0067 6574
3637540 5f63 6f72 7265 6374 5f6c 656e 6774 685f 5f39 7061 7261 6d65 7465 7246 7620 6765 745f 7061 7261 5f6c 656e 6774 685f 5f39
3637620 7061 7261 6d65 7465 7246 7620 6765 745f 7061 7261 5f73 7461 7475 735f 5f39 7061 7261 6d65 7465 7246 7620 6765 745f 7061
3637700 7261 6d65 7465 725f 7661 6c75 655f 5f39 7061 7261 6d65 7465 7246 7620 6765 745f 7061 7261 6d65 7465 725f 7661 6c75 655f
3637760 7479 7065 5f5f 3970 6172 616d 6574 6572 4676 2067 6574 5f70 6172 616d 6574 6572 5f73 7661 6c75 655f 5f39 7061 7261 6d65
3640040 7465 7246 7620 5c00 6765 745f 7061 7261 6d65 7465 725f 6976 616c 7565 5f5f 3970 6172 616d 6574 6572 4676 2067 6574 5f70
3640120 6172 616d 6574 6572 5f66 7661 6c75 655f 5f39 7061 7261 6d65 7465 7246 7620 7365 745f 7061 7261 6d65 7465 725f 6e61 6d65
3640200 5f5f 3970 6172 616d 6574 6572 4650 6320 7365 745f 7061 7261 6d65 7465 725f 636c 6173 735f 5f39 7061 7261 6d65 7465 7246
3640260 3130 5061 7261 5f43 6c61 7373 2073 6574 5f70 6172 616d 6574 6572 5f74 7970 655f 5f39 7061 7261 6d65 7465 7246 5063 2073
3640340 6574 5f70 6172 616d 6574 6572 5f73 6c69 6365 5f5f 3970 6172 616d 6574 6572 4650 6320 5c00 7365 745f 7061 7261 6d65 7465
3640420 725f 7372 616e 6765 5f5f 3970 6172 616d 6574 6572 4650 6320 7365 745f 7061 7261 6d65 7465 725f 5058 5265 665f 5f39 7061
3640500 7261 6d65 7465 7246 5063 5035 626c 6f63 6b20 7365 745f 7061 7261 6d65 7465 725f 7261 6e67 655f 5f39 7061 7261 6d65 7465
3640560 7246 5063 2073 6574 5f70 6172 616d 6574 6572 5f6d 6f64 655f 5f39 7061 7261 6d65 7465 7246 5063 2073 6574 5f70 6172 616d
3640640 6574 6572 5f76 616c 7565 5f5f 3970 6172 616d 6574 6572 4650 6320 7365 745f 7061 7261 6d65 7465 725f 7661 6c75 655f 5f39
3640720 7061 7261 6d65 7465 7246 6920 5c00 7365 745f 7061 7261 6d65 7465 725f 7661 6c75 655f 5f39 7061 7261 6d65 7465 7246 6620
3641000 7365 745f 7061 7261 6d65 7465 725f 7661 6c75 655f 7479 7065 5f5f 3970 6172 616d 6574 6572 4650 6320 6765 745f 5648 444c
3641060 5f46 6f72 6d61 6c5f 5061 7261 6d5f 5f39 7061 7261 6d65 7465 7246 5063 6920 6765 745f 5648 444c 5f50 726d 7472 5f5f 3970
3641140 6172 616d 6574 6572 4650 6369 2067 6574 5f56 4944 4c5f 4578 7061 6e64 6564 5f46 6f72 6d61 6c5f 5061 7261 6d5f 5f39 7061
3641220 7261 6d65 7465 7246 5035 626c 6f63 6b50 6369 205c 0067 6574 5f56 4844 4c5f 4578 7061 6e64 6564 5f50 726d 7472 5f4d 6170
3641300 5f5f 3970 6172 616d 6574 6572 4650 3562 6c6f 636b 5063 6920 6578 706c 6169 6e5f 5f39 7061 7261 6d65 7465 7246 5063 203b
3641360 3b3b 005f 5f70 7462 6c5f 5f39 7061 7261 6d65 7465 725f 5f43 6f75 6e74 6572 5f63 7878 3a47 2830 2c33 3329 0062 6c6f 636b
3641440 5f61 7474 7269 6275 7465 733a 5428 302c 3938 293d 7332 385f 5f76 7074 725f 5f36 4f62 6a65 6374 3a28 302c 3333 292c 302c
3641520 3332 3b6e 616d 655f 5f37 4e4f 626a 6563 743a 2830 2c32 3029 2c33 322c 3332 3b6e 616d 655f 5f31 3662 6c6f 636b 5f61 7474
3641600 7269 6275 7465 733a 2830 2c32 3029 2c36 342c 3332 3b76 616c 7565 5f5f 3136 626c 6f63 6b5f 6174 7472 6962 7574 6573 3a28
3641660 302c 3935 292c 3936 2c31 3238 3b3b 0062 6c6f 636b 5f61 7474 7269 6275 7465 733a 5a63 626c 6f63 6b5f 6174 7472 6962 7574
3641740 6573 3b4e 4f62 6165 6374 3b5f 5f63 745f 5f31 3662 6c6f 636b 5f61 7474 7269 6275 7465 7346 5063 205f 5f63 745f 5f31 3662
3642020 6c6f 636b 5f61 7474 7269 6275 7465 7346 7620 5f5f 6374 5f5f 3136 626c 6f63 6b5f 6174 7472 6962 7574 6573 4652 4331 3662
```

| | | | | | | | | | | | | | | | | | | | | | | | | |
|---|---|---|---|---|---|---|---|---|---|---|---|---|---|---|---|---|---|---|---|---|---|---|---|---|
| 3642100 | 6c6f | 636b | 5f61 | 7474 | 7269 | 6275 | 7465 | 7320 | 5f5f | 6474 | 5f5f | 3136 | 626c | 6f63 | 6b5f | 6174 | 7472 | 6962 | 7574 | 6573 | 4676 | 2073 | 6574 | 5f61 |
| 3642160 | 7474 | 7269 | 6275 | 7465 | 5f6e | 616d | 655f | 5f31 | 3662 | 6c6f | 636b | 5f61 | 7474 | 7269 | 6275 | 7465 | 7346 | 5063 | 205c | 0073 | 6574 | 5f61 | 7474 | 7269 |
| 3642240 | 6275 | 7465 | 5f76 | 616c | 7565 | 5f5f | 3136 | 626c | 6f63 | 6b5f | 6174 | 7472 | 6962 | 7574 | 6573 | 4650 | 6320 | 7365 | 745f | 6174 | 7472 | 6962 | 7574 | 655f |
| 3642320 | 7661 | 6c75 | 655f | 5f31 | 3662 | 6c6f | 636b | 5f61 | 7474 | 7269 | 6275 | 7465 | 7346 | 6920 | 7365 | 745f | 6174 | 7472 | 6962 | 7574 | 655f | 7661 | 6c75 | 655f |
| 3642400 | 5f31 | 3662 | 6c6f | 636b | 5f61 | 7474 | 7269 | 6275 | 7465 | 7346 | 6620 | 7365 | 745f | 6174 | 7472 | 6962 | 7574 | 655f | 7479 | 7065 | 5f5f | 3136 | 626c | 6f63 |
| 3642460 | 6b5f | 6174 | 7472 | 6962 | 7574 | 6573 | 4650 | 6320 | 6765 | 745f | 6174 | 7472 | 6962 | 7574 | 655f | 6e61 | 6d65 | 5f5f | 3136 | 626c | 6f63 | 6b5f | 6174 | 7472 |
| 3642540 | 6962 | 7574 | 6573 | 4676 | 205c | 0067 | 6574 | 5f61 | 7474 | 7269 | 6275 | 7465 | 5f74 | 7970 | 655f | 5f31 | 3662 | 6c6f | 636b | 5f61 | 7474 | 7269 | 6275 | 7465 |
| 3642620 | 7346 | 7620 | 6765 | 745f | 6174 | 7472 | 6962 | 7574 | 655f | 7376 | 616c | 7565 | 5f5f | 3136 | 626c | 6f63 | 6b5f | 6174 | 7472 | 6962 | 7574 | 6573 | 4676 | 2067 |
| 3642700 | 6574 | 5f61 | 7474 | 7269 | 6275 | 7465 | 5f69 | 7661 | 6c75 | 655f | 5f31 | 3662 | 6c6f | 636b | 5f61 | 7474 | 7269 | 6275 | 7465 | 7346 | 7620 | 6765 | 745f | 6174 |
| 3642760 | 7472 | 6962 | 7574 | 655f | 6676 | 616c | 7565 | 5f5f | 3136 | 626c | 6f63 | 6b5f | 6174 | 7472 | 6962 | 7574 | 6573 | 4676 | 2067 | 6574 | 5f61 | 7474 | 7269 | 6275 |
| 3643040 | 7465 | 5f76 | 616c | 7565 | 5f5f | 3136 | 626c | 6f63 | 6b5f | 6174 | 7472 | 6962 | 7574 | 6573 | 4676 | 205c | 0065 | 7870 | 6c61 | 696e | 5f5f | 3136 | 626c | 6f63 |
| 3643120 | 6b5f | 6174 | 7472 | 6962 | 7574 | 6573 | 4650 | 6320 | 3b3b | 3b00 | 5f5f | 7074 | 626c | 5f5f | 3136 | 626c | 6f63 | 6b5f | 6174 | 7472 | 6962 | 7574 | 6573 | 5f5f |
| 3643200 | 436f | 756e | 7465 | 725f | 6378 | 783a | 4728 | 302c | 3333 | 2900 | 656e | 7469 | 7479 | 3a54 | 2830 | 2c39 | 3929 | 3d73 | 3630 | 5f5f | 7670 | 7472 | 5f5f | 364f |
| 3643260 | 626a | 6563 | 743a | 2830 | 2c33 | 3329 | 2c30 | 2c33 | 323b | 6e61 | 6d65 | 5f5f | 374e | 4f62 | 6a65 | 6374 | 3a28 | 302c | 3230 | 292c | 3332 | 2c33 | 323b | 6e61 |
| 3643340 | 6d65 | 5f5f | 3665 | 6e74 | 6974 | 793a | 2830 | 2c32 | 3029 | 2c36 | 342c | 3332 | 3b46 | 696c | 654e | 616d | 655f | 5f36 | 656e | 7469 | 7479 | 3a28 | 302c | 3230 |
| 3643420 | 292c | 3936 | 2c33 | 323b | 6172 | 6368 | 6e61 | 6d65 | 5f5f | 3665 | 6e74 | 6974 | 793a | 2830 | 2c32 | 3029 | 2c31 | 3238 | 2c33 | 323b | 7479 | 7065 | 5f5f | 3665 |
| 3643500 | 6e74 | 6974 | 793a | 2930 | 2c31 | 292c | 3136 | 302c | 3332 | 3b61 | 7263 | 685f | 6c69 | 6e65 | 5f5f | 3665 | 6e74 | 6974 | 793a | 2830 | 2c31 | 292c | 3139 | 322c |
| 3643560 | 3332 | 3b63 | 616c | 6c5f | 6c69 | 6e65 | 5f5f | 3665 | 6e74 | 6974 | 793a | 2830 | 2c31 | 292c | 3232 | 342c | 3332 | 3b5c | 0070 | 7263 | 735f | 6c69 | 6e65 | 5f5f |
| 3643640 | 3665 | 6e74 | 6974 | 793a | 2830 | 2c31 | 292c | 3235 | 362c | 3332 | 3b71 | 7561 | 6c69 | 6669 | 6564 | 5f5f | 3665 | 6e74 | 6974 | 793a | 2830 | 2c38 | 3829 | 2c32 |
| 3643720 | 3838 | 2c39 | 363b | 7375 | 625f | 626c | 6f63 | 6b73 | 5f5f | 3665 | 6e74 | 6974 | 793a | 2830 | 2c38 | 3829 | 2c33 | 3834 | 2c39 | 363b | 3b00 | 656e | 7469 | 7479 |
| 3644000 | 3a5a | 6365 | 6e74 | 6974 | 793b | 4e4f | 626a | 6563 | 743b | 5f5f | 6374 | 5f5f | 3665 | 6e74 | 6974 | 7946 | 7620 | 5f5f | 6374 | 5f5f | 3665 | 6e74 | 6974 | 7946 |
| 3644060 | 5243 | 3665 | 6e74 | 6974 | 7920 | 5f5f | 6474 | 5f5f | 3665 | 6e74 | 6974 | 7946 | 7620 | 7365 | 745f | 656e | 7469 | 7479 | 5f6e | 616d | 655f | 5f36 | 656e | 7469 |
| 3644140 | 7479 | 4650 | 6320 | 7365 | 745f | 656e | 7469 | 7479 | 5f66 | 696c | 655f | 5f36 | 656e | 7469 | 7479 | 4650 | 6320 | 7365 | 745f | 656e | 7469 | 7479 | 5f61 | 7263 |
| 3644220 | 686e | 616d | 655f | 5f36 | 656e | 7469 | 7479 | 4650 | 6320 | 7365 | 745f | 656e | 7469 | 7479 | 5f74 | 7970 | 655f | 5f36 | 656e | 7469 | 7479 | 4650 | 6320 | 5c00 |
| 3644300 | 7365 | 745f | 6172 | 6368 | 5f6c | 696e | 655f | 5f36 | 656e | 7469 | 7479 | 4669 | 2073 | 6574 | 5f63 | 616c | 6c5f | 6c69 | 6e65 | 5f5f | 3665 | 6e74 | 6974 | 7946 |
| 3644360 | 6920 | 7365 | 745f | 7072 | 6373 | 5f6c | 696e | 655f | 5f36 | 656e | 7469 | 7479 | 4669 | 2067 | 6574 | 5f65 | 6e74 | 6974 | 795f | 6e61 | 6d65 | 5f5f | 3665 | 6e74 |
| 3644440 | 6974 | 7946 | 7620 | 6765 | 745f | 656e | 7469 | 7479 | 5f61 | 7263 | 686e | 616d | 655f | 5f36 | 656e | 7469 | 7479 | 4676 | 2067 | 6574 | 5f65 | 6e74 | 6974 | 795f |
| 3644520 | 6669 | 6c65 | 5f5f | 3665 | 6e74 | 6974 | 7946 | 7620 | 6765 | 745f | 656e | 7469 | 7479 | 5f74 | 7970 | 655f | 5f36 | 656e | 7469 | 7479 | 4676 | 205c | 0067 | 6574 |
| 3644600 | 5f61 | 7263 | 685f | 6c69 | 6e65 | 5f5f | 3665 | 6e74 | 6974 | 7946 | 7620 | 6765 | 745f | 6361 | 6c6c | 5f6c | 696e | 655f | 5f36 | 656e | 7469 | 7479 | 4676 | 2067 |
| 3644660 | 6574 | 5f70 | 7263 | 735f | 6c69 | 6e65 | 5f5f | 3665 | 6e74 | 6974 | 7946 | 7620 | 6973 | 4754 | 455f | 5f36 | 656e | 7469 | 7479 | 4650 | 364f | 626a | 6563 | 7420 |
| 3644740 | 6973 | 4c54 | 455f | 5f36 | 656e | 7469 | 7479 | 4650 | 364f | 626a | 6563 | 7420 | 6578 | 706c | 6169 | 6e5f | 5f36 | 656e | 7469 | 7479 | 4650 | 6320 | 3b3b | 3b00 |
| 3645020 | 5f5f | 7074 | 626c | 5f5f | 3665 | 6e74 | 6974 | 795f | 5f43 | 6f75 | 6e74 | 6572 | 5f63 | 7878 | 3a47 | 2830 | 2c33 | 3329 | 0062 | 6c6f | 636b | 3a54 | 2830 | 2c31 |
| 3645100 | 3030 | 293d | 7331 | 3430 | 5f5f | 7670 | 7472 | 5f5f | 364f | 626a | 6563 | 743a | 2830 | 2c33 | 3329 | 2c30 | 2c33 | 323b | 6e61 | 6d65 | 5f5f | 374e | 4f62 | 6a65 |
| 3645160 | 6374 | 3a28 | 302c | 3230 | 292c | 3332 | 2c33 | 323b | 6e61 | 6d65 | 5f5f | 3562 | 6c6f | 636b | 3a28 | 302c | 3230 | 292c | 3634 | 2c33 | 323b | 7479 | 7065 | 5f5f |
| 3645240 | 3562 | 6c6f | 636b | 3a28 | 302c | 3129 | 2c39 | 362c | 3332 | 3b4d | 475f | 4e61 | 6d65 | 5f5f | 3562 | 6c6f | 636b | 3a28 | 302c | 3230 | 292c | 3132 | 382c | 3332 |
| 3645320 | 3b4d | 475f | 5479 | 7065 | 5f5f | 3562 | 6c6f | 636b | 3a28 | 302c | 3230 | 292c | 3136 | 302c | 3332 | 3b4d | 475f | 5375 | 6254 | 7970 | 655f | 5f35 | 626c | 6f63 |
| 3645400 | 6b3a | 2830 | 2c32 | 3029 | 2c31 | 3932 | 2c33 | 323b | 5061 | 7265 | 6e74 | 5f5f | 3562 | 6c6f | 636b | 3a28 | 302c | 3939 | 292c | 3232 | 342c | 3438 | 303b | 5c00 |
| 3645460 | 4d47 | 4473 | 6372 | 7074 | 6e5f | 5f35 | 626c | 6f63 | 6b3a | 2830 | 2c31 | 3031 | 293d | 2a28 | 302c | 3932 | 292c | 3730 | 342c | 3332 | 3b41 | 6374 | 7561 | 6c5f |
| 3645540 | 5f35 | 626c | 6f63 | 6b3a | 2830 | 2c38 | 3829 | 2c37 | 3336 | 2c39 | 363b | 466f | 726d | 616c | 5f5f | 3562 | 6c6f | 636b | 3a28 | 302c | 3839 | 292c | 3833 | 322c |
| 3645620 | 3936 | 3b52 | 6573 | 6f6c | 7665 | 645f | 5f35 | 626c | 6f63 | 6b3a | 2830 | 2c38 | 3829 | 2c39 | 3238 | 2c39 | 363b | 4174 | 7472 | 6962 | 7574 | 6573 | 5f5f | 3562 |
| 3645700 | 6c6f | 636b | 3a28 | 302c | 3838 | 292c | 3130 | 3234 | 2c39 | 363b | 3b00 | 626c | 6f63 | 6b3a | 5a63 | 626c | 6f63 | 6b3b | 4e4f | 626a | 6563 | 743b | 5f5f | 6374 |
| 3645760 | 5f5f | 3562 | 6c6f | 636b | 4676 | 205f | 5f63 | 745f | 5f35 | 626c | 6f63 | 6b46 | 5243 | 3562 | 6c6f | 636b | 205f | 5f64 | 745f | 5f35 | 626c | 6f63 | 6b46 | 7620 |
| 3646040 | 7365 | 745f | 626c | 6f63 | 6b5f | 6e61 | 6d65 | 5f5f | 3562 | 6c6f | 636b | 4650 | 6320 | 7365 | 745f | 626c | 6f63 | 6b5f | 7479 | 7065 | 5f5f | 3562 | 6c6f | 636b |
| 3646120 | 4650 | 6320 | 6765 | 745f | 626c | 6f63 | 6b5f | 6e61 | 6d65 | 5f5f | 3562 | 6c6f | 636b | 4676 | 2067 | 6574 | 5f62 | 6c6f | 636b | 5f74 | 7970 | 655f | 5f35 | 626c |
| 3646200 | 6f63 | 6b46 | 7620 | 6765 | 745f | 626c | 6f63 | 6b5f | 7061 | 7265 | 6e74 | 5f5f | 3562 | 6c6f | 636b | 4676 | 205c | 0067 | 6574 | 5f62 | 6c6f | 636b | 5f4d | 6f64 |
| 3646260 | 4765 | 6e5f | 5f35 | 626c | 6f63 | 6b46 | 7620 | 6765 | 745f | 456f | 726d | 616c | 5f5f | 3562 | 6c6f | 636b | 4676 | 2067 | 6574 | 5f41 | 6374 | 7561 | 6c5f | 5f35 |
| 3646340 | 626c | 6f63 | 6b46 | 7620 | 6765 | 745f | 5265 | 736f | 6c76 | 6564 | 5f5f | 3562 | 6c6f | 636b | 4676 | 2067 | 6574 | 5f41 | 7474 | 7269 | 6275 | 7465 | 5f5f | 3562 |
| 3646420 | 6c6f | 636b | 4676 | 2067 | 6574 | 5f63 | 6f6d | 705f | 6c65 | 6e67 | 7468 | 5f5f | 3562 | 6c6f | 636b | 4676 | 2069 | 7351 | 7561 | 6c69 | 6669 | 6564 | 5f5f | 3562 |
| 3646500 | 6c6f | 636b | 4676 | 2069 | 734c | 5445 | 5f5f | 3562 | 6c6f | 636b | 4650 | 364f | 626a | 6563 | 7420 | 5c00 | 6973 | 4754 | 455f | 5f35 | 626c | 6f63 | 6b46 | 5036 |
| 3646560 | 4f62 | 6a65 | 6374 | 2065 | 7870 | 6c61 | 696e | 5f5f | 3562 | 6c6f | 636b | 4650 | 6320 | 5265 | 7665 | 7273 | 6541 | 6c6c | 4c69 | 7374 | 735f | 5f35 | 626c | 6f63 |
| 3646640 | 6b46 | 7620 | 4368 | 6563 | 6b50 | 6172 | 614c | 6973 | 7473 | 5f5f | 3562 | 6c6f | 636b | 4676 | 2043 | 6865 | 636b | 5061 | 7261 | 6d4c | 6973 | 745f | 5f35 | 626c |
| 3646720 | 6f63 | 6b46 | 5035 | 504c | 6973 | 7420 | 575f | 5648 | 444c | 5f43 | 6f6d | 7049 | 6e73 | 745f | 5f35 | 626c | 6f63 | 6b46 | 7620 | 575f | 5648 | 444c | 5f43 | 6f6d |
| 3647000 | 7044 | 6563 | 5f5f | 3562 | 6c6f | 636b | 4676 | 2067 | 6574 | 5f56 | 4844 | 4c5f | 436f | 6d70 | 4c61 | 626c | 655f | 5f35 | 626c | 6f63 | 6b46 | 5063 | 205c | 0067 |
| 3647060 | 6574 | 5f56 | 4844 | 4c5f | 436f | 6d70 | 4e61 | 6d65 | 5f5f | 3562 | 6c6f | 636b | 4650 | 6320 | 575f | 4d47 | 5f43 | 6f6d | 7044 | 7363 | 7270 | 746e | 5f5f | 3562 |
| 3647140 | 6c6f | 636b | 4676 | 2057 | 5f4d | 475f | 4368 | 6563 | 6b43 | 6f6d | 705f | 5f35 | 626c | 6f63 | 6b46 | 7620 | 575f | 434c | 5f41 | 7263 | 6842 | 6f64 | 795f | 5f35 |

```
3647220 626c 6f63 6b46 7620 575f 434c 5f45 6e74 6974 7944 6563 5f5f 3562 6c6f 636b 4676 203b 3b3b 005f 5f70 7462 6c5f 5f35 626c
3647300 6f63 6b5f 5f43 6f75 6e74 6572 5f63 7878 3a47 2830 2c33 3329 005f 5f63 745f 5f36 656e 7469 7479 4676 3a66 2830 2c31 3032
3647360 293d 2a28 302c 3939 2900 5f5f 3074 6869 733a 7028 302c 3130 3229 002f 686f 6d65 2f6f 7361 7331 2f61 2f61 622f 7372 632f
3647440 6e65 776f 526a 6563 7473 2f77 726f 672f 6878 782f 656e 7469 7479 2e68 787d 005f 5f30 7468 6973 3a72 2830 2c31 3032 2900
3647520 5f5f 3074 6869 7320 3a5a 746c 005f 5f63 745f 5f36 656e 7469 7479 4676 203a 5a74 4600 4465 7369 676e 556e 6974 3a54 2830
3647600 2c31 3033 293d 7335 325f 5f76 7074 725f 5f36 4f62 6a65 6374 3a28 302c 3333 292c 302c 3332 3b6e 616d 655f 5f37 4e4f 626a
3647660 6563 743a 2830 2c32 3029 2c33 322c 3332 3b44 6555 6e4e 616d 655f 5f31 3044 6573 6967 6e55 6e69 743a 2830 2c32 3029 2c36
3647740 342c 3332 3b46 696c 654e 6161 655f 5f31 3044 6573 6967 6e55 6e69 743a 2830 2c32 3029 2c39 362c 3332 3b41 7263 684e 616d
3650020 655f 5f31 3044 6573 6967 6e55 6e69 743a 2830 2c32 3029 2c31 3238 2c33 323b 4465 556e 5479 7065 5f5f 3130 4465 7369 676e
3650100 556e 6974 3a28 302c 3129 2c31 3630 2c33 323b 4172 6368 4c69 6e65 5f5f 3130 4465 7369 676e 556e 6974 3a28 302c 3129 2c31
3650160 3932 2c33 323b 5175 616c 6966 6965 645f 5f31 3044 6573 6967 6e55 6e69 743a 2830 2c38 3829 2c32 3234 2c39 363b 5375 6242
3650240 6c6f 636b 735f 5f31 3044 6573 6967 6e55 6e69 743a 2830 2c38 3829 2c33 3230 2c39 363b 3b00 4465 7369 676e 556e 6974 3a5a
3650320 6344 6573 6967 6e55 6e69 743b 4e4f 626a 6563 743b 5f5f 6374 5f5f 3130 4465 7369 676e 556e 6974 4676 205f 5f63 745f 5f31
3650400 3044 6573 6967 6e55 6e69 7446 5063 205f 5f63 745f 5f31 3044 6573 6967 6e55 6e69 7446 5036 656e 7469 7479 205f 5f63 745f
3650460 5f31 3044 6573 6967 6e55 6e69 7446 5243 3130 4465 7369 676e 556e 6974 205f 5f64 745f 5f31 3044 6573 6967 6e55 6e69 7446
3650540 7620 7365 745f 4455 5f44 6555 6e4e 616d 655f 5f31 3044 6573 6967 6e55 6e69 7446 5063 205c 0073 6574 5f44 555f 4669 6c65
3650620 4e61 6d65 5f5f 3130 4465 7369 676e 556e 6974 4650 6320 7365 745f 4455 5f41 7263 684e 616d 655f 5f31 3044 6573 6967 6e55
3650700 6e69 7446 5063 2073 6574 5f44 555f 4465 556e 5479 7065 5f5f 3130 4465 7369 676e 556e 6974 4669 2073 6574 5f44 555f 4172
3650760 6368 4c69 6e65 5f5f 3130 4465 7369 676e 556e 6974 4669 2067 6574 5f44 555f 4669 6c65 4e61 6d65 5f5f 3130 4465 7369 676e
3651040 556e 6974 4676 2045 7175 616c 5f5f 3130 4465 7369 676e 556e 6974 4650 3665 6e74 6974 7920 5c00 6973 4754 455f 5f31 3044
3651120 6573 6967 6e55 6e69 7446 5036 4f62 6a65 6374 2069 734c 5445 5f5f 3130 4465 7369 676e 556e 6974 4650 364f 626a 6563 7420
3651200 6765 745f 4455 5f51 7561 6c69 6669 6564 5f5f 3130 4465 7369 676e 556e 6974 4676 2067 6574 5f44 555f 5375 6242 6c6f 636b
3651260 735f 5f31 3044 6573 6967 6e55 6e69 7446 7620 4578 7061 6e64 5f56 4844 4c5f 4455 5f5f 3130 4465 7369 676e 556e 6974 4676
3651340 2065 7870 6c61 696e 5f5f 3130 4465 7369 676e 556e 6974 4650 6320 3b3b 3b00 5f5f 7074 626c 5f5f 3130 4465 7369 676e 556e
3651420 6974 5f5f 436f 756e 7465 725f 6378 783a 4728 302c 3333 2900 4669 6c65 556e 6974 3a54 2830 2c31 3034 293d 7332 345f 5f76
3651500 7074 725f 5f36 4f62 6a65 6374 3a28 302c 3333 292c 302c 3332 3b6e 616d 655f 5f37 4e4f 626a 6563 743a 2830 2c32 3029 2c33
3651560 322c 3332 3b46 696c 654e 6161 655f 5f38 4669 6c65 556e 6974 3a28 302c 3230 292c 3634 2c33 323b 456e 7469 7479 4c69 7374
3651640 5f5f 3846 696c 6555 6e69 743a 2830 2c38 3829 2c39 362c 3936 3b3b 0046 696c 6555 6e69 743a 5a63 4669 6c65 556e 6974 3b4e
3651720 4f62 6a65 6374 3b5f 5f63 745f 5f38 4669 6c65 556e 6974 4676 205f 5f63 745f 5f38 4669 6c65 556e 6974 4650 6320 5f5f 6374
3652000 5f5f 3846 696c 6555 6e69 7446 5243 3846 696c 6555 6e69 7420 5f5f 6474 5f5f 3846 696c 6555 6e69 7446 7620 7365 745f 4655
3652060 5f46 696c 654e 616d 655f 5f38 4669 6c65 556e 6974 4650 6320 6765 745f 4655 5f46 696c 654e 616d 655f 5f38 4669 6c65 556e
3652140 6974 4676 2067 6574 5f45 6e74 6974 794c 6973 745f 5f38 4669 6c65 556e 6974 4676 205c 0045 7870 616e 645f 5648 444c 5f44
3652220 555f 5f38 4669 6c65 556e 6974 4676 2065 7870 6c61 696e 5f5f 3846 696c 6555 6e69 7446 5063 203b 3b3b 005f 5f70 7462 6c5f
3652300 5f38 4669 6c65 556e 6974 5f5f 436f 756e 7465 725f 6378 783a 4728 302c 3333 2900 416c 6c42 6c6f 636b 733a 5428 302c 3130
3652360 3529 3d73 3434 5f5f 7670 7472 5f5f 364f 626a 6563 743a 2830 2c33 3329 2c30 2c33 323b 6e61 6d65 5f5f 374e 4f62 6a65 6374
3652440 3a28 302c 3230 292c 3332 2c33 323b 426c 6f63 6b4c 6973 745f 5f39 416c 6c42 6c6f 636b 733a 2830 2c38 3829 2c36 342c 3936
3652520 3b44 554c 6973 745f 5f39 416c 6c42 6c6f 636b 733a 2830 2c38 3829 2c31 3630 2c39 363b 4655 4c69 7374 5f5f 3941 6c6c 426c
3652600 6f63 6b73 3a28 302c 3838 292c 3235 362c 3936 3b3b 0041 6c6c 426c 6f63 6b73 3a5a 6341 6c6c 426c 6f63 6b73 3b4e 4f62 6a65
3652660 6374 3b5f 5f63 745f 5f39 416c 6c42 6c6f 636b 7346 7620 5f5f 6374 5f5f 3941 6c6c 426c 6f63 6b73 4652 4339 416c 6c42 6c6f
3652740 636b 7320 5f5f 6474 5f5f 3941 6c6c 426c 6f63 6b73 4676 2067 6574 5f42 6c6f 636b 4c69 7374 5f5f 3941 6c6c 426c 6f63 6b73
3653020 4676 2067 6574 5f44 554c 6973 745f 5f39 416c 6c42 6c6f 636b 7346 7620 6765 745f 4655 4c69 7374 5f5f 3941 6c6c 426c 6f63
3653100 6b73 4676 2052 6561 645f 5648 444c 5f42 6c6b 4669 6c65 5f5f 3941 6c6c 426c 6f63 6b73 4650 6320 5c00 5265 7665 7273 6550
3653160 6172 616d 4c69 7374 735f 5f39 416c 6c42 6c6f 636b 7346 7620 6461 6b65 5f44 554c 6973 745f 5f39 416c 6c42 6c6f 636b 7346
3653240 7620 6461 6b65 5f46 554c 6973 745f 5f39 416c 6c42 6c6f 636b 7346 7620 4578 7061 6e64 5f56 4844 4c5f 4655 5f5f 3941 6c6c
3653320 426c 6f63 6b73 4676 2065 7870 6c61 696e 5f5f 3941 6c6c 426c 6f63 6b73 4650 6320 3b3b 3b00 5f5f 7074 626c 5f5f 3941 6c6c
3653400 426c 6f63 6b73 5f5f 436f 756e 7465 725f 6378 783a 4728 302c 3333 2900 4d47 5f53 7065 6369 6669 633a 5428 302c 3130 3629
3653460 3d73 3132 7465 6368 6e6f 6c6f 6779 5f5f 3131 4447 5f53 7065 6369 6669 633a 2830 2c32 3029 2c30 2c33 323b 6c62 735f 7465
3653540 6368 4e75 6d5f 5f31 3144 475f 5370 6563 6966 6963 3a28 302c 3129 2c33 322c 3332 3b4d 656d 5f74 6563 684e 756d 5f5f 3131
3653620 4447 5f53 7065 6369 6669 633a 2830 2c31 292c 3634 2c33 323b 3b00 4d47 5f53 7065 6369 6669 633a 5a63 4d47 5f53 7065 6369
3653700 6669 633b 3b5f 5f63 745f 5f31 314d 475f 5370 6563 6966 6963 4676 205f 5f64 745f 5f31 314d 475f 5370 6563 6966 6963 4676
3653760 2073 6574 5f74 6563 686e 6f6c 6f67 795f 6e61 6d65 5f5f 3131 4447 5f53 7065 6369 6669 6346 5063 2067 6574 5f6c 6273 5f74
3654040 6563 684e 756d 5f5f 3131 4d47 5f53 7065 6369 6669 6346 7620 6765 745f 4d65 6d5f 7465 6368 4e75 645f 5f31 314d 475f 5370
3654120 6563 6966 6963 4676 2067 6574 5f74 6563 684e 616d 655f 5f31 314d 475f 5370 6563 6966 6963 4676 205c 0065 7870 6c61 696e
3654200 5f5f 3131 4d47 5f53 7065 6369 6669 6346 5063 203b 3b3b 0043 6f75 6e74 6572 3a54 2830 2c31 3037 293d 7337 3642 6974 5769
3654260 6474 685f 5f36 416f 6447 656e 3a28 302c 3129 2c30 2c33 323b 4553 7461 7465 5f5f 364d 6f64 4765 6e3a 2830 2c37 3829 2c33
```

| | | | | | | | | | | | | | | | | | | | | | | | | |
|---|---|---|---|---|---|---|---|---|---|---|---|---|---|---|---|---|---|---|---|---|---|---|---|---|
| 3654340 | 322c | 3332 | 3b50 | 696e | 4e61 | 6d65 | 4c65 | 6e67 | 7468 | 5f5f | 364d | 6f64 | 4765 | 6e3a | 2830 | 2c38 | 3829 | 2c36 | 342c | 3936 | 3b5f | 5f76 | 7074 | 725f |
| 3654420 | 5f36 | 436f | 6447 | 656e | 3a28 | 302c | 3333 | 292c | 3136 | 302c | 3332 | 3b74 | 7970 | 655f | 5f37 | 436f | 756e | 7465 | 723a | 2830 | 2c32 | 3029 | 2c31 | 3932 |
| 3654500 | 2c33 | 323b | 6d61 | 696e | 5f6d | 656e | 755f | 5f37 | 436f | 756e | 7465 | 723a | 2830 | 2c31 | 292c | 3232 | 342c | 3332 | 3b73 | 7562 | 5f6d | 656e | 755f | 5f37 |
| 3654560 | 436f | 756e | 7465 | 723a | 2830 | 2c31 | 292c | 3235 | 362c | 3332 | 3b6d | 6f64 | 756c | 656e | 616d | 655f | 5f37 | 436f | 756e | 7465 | 723a | 2830 | 2c32 | 3029 |
| 3654640 | 2c32 | 383d | 2c33 | 323b | 5c00 | 6269 | 7473 | 5f5f | 3743 | 6f75 | 6e74 | 6572 | 3a28 | 302c | 3129 | 2c33 | 3230 | 2c33 | 323b | 434c | 4e5f | 5f37 | 436f | 756e |
| 3654720 | 7465 | 723a | 2830 | 2c37 | 3829 | 2c33 | 3532 | 2c33 | 323b | 4344 | 5f5f | 3743 | 6f75 | 6e74 | 6572 | 3a28 | 302c | 3738 | 292c | 3338 | 342c | 3332 | 3b53 | 445f |
| 3655000 | 5f37 | 436f | 756e | 7465 | 723a | 2830 | 2c37 | 3829 | 2c34 | 3136 | 2c33 | 323b | 4345 | 5f5f | 3743 | 6f75 | 6e74 | 6572 | 3a28 | 302c | 3738 | 292c | 3434 | 382c |
| 3655060 | 3332 | 3b41 | 4c5f | 5f37 | 436f | 756e | 7465 | 723a | 2830 | 2c37 | 3829 | 2c34 | 3830 | 2c33 | 323b | 5354 | 4e5f | 5f37 | 436f | 756e | 7465 | 723a | 2830 | 2c37 |
| 3655140 | 3829 | 2c35 | 3132 | 2c33 | 323b | 4c44 | 5f5f | 3743 | 6f75 | 6e74 | 6572 | 3a29 | 302c | 3738 | 292c | 3534 | 342c | 3332 | 3b52 | 616e | 6765 | 5f5f | 3743 | 6f75 |
| 3655220 | 6e74 | 6572 | 3a28 | 302c | 3738 | 292c | 3537 | 362c | 3332 | 3b3b | 0043 | 6f75 | 6e74 | 6572 | 3a5a | 6343 | 6f75 | 6e74 | 6572 | 3b4d | 6f64 | 4765 | 6e3b | 5f5f |
| 3655300 | 6374 | 5f5f | 3743 | 6f75 | 6e74 | 6572 | 4650 | 6320 | 5f5f | 6374 | 5f5f | 3743 | 6f75 | 6e74 | 6572 | 4676 | 205f | 5f63 | 745f | 5f37 | 436f | 756e | 7465 | 7246 |
| 3655360 | 5243 | 3743 | 6f75 | 6e74 | 6572 | 205f | 5f64 | 745f | 5f37 | 436f | 756e | 7465 | 7246 | 7620 | 7365 | 744e | 616d | 6549 | 6e64 | 6578 | 5f5f | 3743 | 6f75 | 6e74 |
| 3655440 | 6572 | 4650 | 6320 | 7365 | 7449 | 6e64 | 6578 | 5f5f | 3743 | 6f75 | 6e74 | 6572 | 4676 | 204c | 6f61 | 645f | 5648 | 444c | 5f44 | 6174 | 615f | 5f37 | 436f | 756e |
| 3655520 | 7465 | 7246 | 5037 | 4e4f | 626a | 6563 | 7420 | 436f | 6d70 | 6f73 | 655f | 4d6f | 6447 | 656e | 5f44 | 6573 | 6372 | 6970 | 746f | 725f | 5f37 | 436f | 756e | 7465 |
| 3655600 | 7246 | 5063 | 205c | 003b | 3b3b | 005f | 5f70 | 7462 | 6c5f | 5f37 | 436f | 756e | 7465 | 725f | 5f43 | 6f75 | 6e74 | 6572 | 5f63 | 7878 | 3a47 | 2830 | 2c33 | 3329 |
| 3655660 | 0074 | 656d | 704d | 473a | 4728 | 302c | 3230 | 2900 | 4d47 | 3a47 | 2830 | 2c31 | 3038 | 293d | 2a28 | 302c | 3130 | 3629 | 0073 | 6574 | 496e | 6465 | 785f | 5f37 |
| 3655740 | 436f | 756e | 7465 | 7246 | 763a | 4628 | 302c | 3229 | 005f | 5f30 | 7468 | 6973 | 3a70 | 2830 | 2c31 | 3039 | 293d | 2a28 | 302c | 3130 | 3729 | 0043 | 6f75 | 6e74 |
| 3656020 | 6572 | 2e63 | 7878 | 005f | 5f30 | 7468 | 6973 | 3a72 | 2830 | 2c31 | 3039 | 2900 | 5f5f | 305f | 5f58 | 4230 | 3079 | 696a | 3064 | 663a | 2830 | 2c37 | 3829 | 005f |
| 3656100 | 5f30 | 7468 | 6973 | 203a | 5a74 | 6c00 | 7365 | 7449 | 6e64 | 6578 | 5f5f | 3743 | 6f75 | 6e74 | 6572 | 4676 | 203a | 5a74 | 4600 | 4c6f | 6154 | 5f56 | 4844 | 4c5f |
| 3656160 | 4461 | 7461 | 5f5f | 3743 | 6f75 | 6e74 | 6572 | 4650 | 374e | 4f62 | 6a65 | 6374 | 3a46 | 2830 | 2c32 | 2900 | 5f5f | 3074 | 6869 | 733a | 7028 | 302c | 3130 | 3929 |
| 3656240 | 005f | 5f30 | 4e3a | 7028 | 302c | 3836 | 2900 | 5f5f | 3074 | 6869 | 733a | 7228 | 302c | 3130 | 3929 | 005f | 5f31 | 423a | 2830 | 2c31 | 3130 | 293d | 2a28 | 302c |
| 3656320 | 3130 | 3029 | 005f | 5f31 | 503a | 2830 | 2c39 | 3729 | 005f | 5f30 | 5f5f | 4b36 | 353a | 2830 | 2c31 | 3131 | 293d | 2a28 | 302c | 3838 | 2900 | 5f5f | 305f | 5f4b |
| 3656400 | 3636 | 3a28 | 302c | 3131 | 3129 | 005f | 5f30 | 5f5f | 4b36 | 373a | 2830 | 2c31 | 3131 | 2900 | 5f5f | 305f | 5f4b | 3638 | 3a28 | 302c | 3131 | 3129 | 005f | 5f30 |
| 3656460 | 5f5f | 4b36 | 393a | 2830 | 2c31 | 3131 | 2900 | 5f5f | 305f | 5f4b | 3730 | 3a28 | 302c | 3131 | 3129 | 005f | 5f30 | 5f5f | 4b37 | 313a | 2830 | 2c31 | 3131 | 2900 |
| 3656540 | 5f5f | 305f | 5f4b | 3732 | 3a28 | 302c | 3131 | 3129 | 005f | 5f30 | 5f5f | 5842 | 3030 | 7969 | 6a30 | 6466 | 3a28 | 302c | 3738 | 2900 | 5f5f | 3074 | 6869 | 7320 |
| 3656620 | 3a5a | 746c | 005f | 5f30 | 4e20 | 3a5a | 746c | 005f | 5f31 | 4220 | 3a5a | 746c | 005f | 5f31 | 5020 | 3a5a | 746c | 005f | 5f30 | 5f5f | 4b36 | 3520 | 3a5a | 746c |
| 3656700 | 005f | 5f30 | 5f5f | 4b36 | 3620 | 3a5a | 746c | 005f | 5f30 | 5f5f | 4b36 | 3720 | 3a5a | 746c | 005f | 5f30 | 5f5f | 4b36 | 3820 | 3a5a | 746c | 005f | 5f30 | 5f5f |
| 3656760 | 4b36 | 3920 | 3a5a | 746c | 005f | 5f30 | 5f5f | 4b37 | 3020 | 3a5a | 746c | 005f | 5f30 | 5f5f | 4b37 | 3120 | 3a5a | 746c | 005f | 5f30 | 5f5f | 4b37 | 3220 | 3a5a |
| 3657040 | 746c | 004c | 6f61 | 645f | 5648 | 444c | 5f44 | 6174 | 615f | 5f37 | 436f | 756e | 7465 | 7246 | 5037 | 4e4f | 626a | 6563 | 7420 | 3a5a | 7446 | 0043 | 6f6d | 706f |
| 3657120 | 7365 | 5f4d | 6f64 | 4765 | 6e5f | 4465 | 7363 | 7269 | 7074 | 6f72 | 5f5f | 3743 | 6f75 | 6e74 | 6572 | 4650 | 633a | 4628 | 302c | 3230 | 2900 | 5f5f | 3074 | 6869 |
| 3657200 | 733a | 7028 | 302c | 3130 | 3929 | 005f | 5f30 | 6275 | 6666 | 3a70 | 2830 | 2c32 | 3029 | 005f | 5f30 | 7468 | 6973 | 3a72 | 2830 | 2c31 | 3039 | 2900 | 5f5f | 316f |
| 3657260 | 7074 | 696f | 6e3a | 2930 | 2c31 | 2900 | 5f5f | 3074 | 6869 | 7320 | 3a5a | 746c | 005f | 5f30 | 6275 | 6666 | 203a | 5a74 | 6c00 | 5f5f | 316f | 7074 | 696f | 6e20 |
| 3657340 | 3a5a | 746c | 0043 | 6f6d | 706f | 7365 | 5f4d | 6f64 | 4765 | 6e5f | 4465 | 7363 | 7269 | 7074 | 6f72 | 5f5f | 3743 | 6f75 | 6e74 | 6572 | 4650 | 6320 | 3a5a | 7446 |
| 3657420 | 005f | 5f73 | 7469 | 5f5f | 436f | 756e | 7465 | 725f | 6378 | 785f | 7365 | 7449 | 6e64 | 6578 | 5f3a | 4628 | 302c | 3229 | 002f | 7573 | 722f | 4343 | 2f73 | 756e |
| 3557500 | 342f | 696e | 636c | 2f69 | 6f73 | 7472 | 6561 | 6d2e | 6800 | 5f5f | 7374 | 645f | 5f43 | 6f75 | 6e74 | 6572 | 5f63 | 7878 | 5f73 | 6574 | 496e | 6465 | 785f | 3a46 |
| 3657560 | 2830 | 2c32 | 2900 | 5f5f | 7674 | 626c | 5f5f | 3743 | 6f75 | 6e74 | 6572 | 3a47 | 2830 | 2c31 | 3132 | 293d | 6172 | 2830 | 2c31 | 293b | 303b | 363b | 2830 | 2c31 |
| 3657640 | 3529 | 005f | 5f76 | 7462 | 6c5f | 5f31 | 3662 | 6c6f | 636b | 5f61 | 7474 | 7269 | 6275 | 7465 | 735f | 5f43 | 6f75 | 6e74 | 6572 | 5f63 | 7878 | 3a47 | 2830 | 2c31 |
| 3657720 | 3133 | 293d | 6172 | 2830 | 2c31 | 293b | 303b | 3130 | 3b28 | 302c | 3135 | 2900 | 5f5f | 7674 | 626c | 5f5f | 384c | 504f | 626a | 6563 | 745f | 5f43 | 6f75 | 6e74 |
| 3660000 | 6572 | 5f63 | 7878 | 3a47 | 2830 | 2c31 | 3134 | 293d | 6172 | 2830 | 2c31 | 293b | 303b | 333b | 2830 | 2c31 | 3529 | 0073 | 6574 | 4e61 | 6d65 | 496e | 6465 | 785f |
| 3660060 | 5f37 | 436f | 756e | 7465 | 7246 | 5063 | 3a66 | 2830 | 2c32 | 2900 | 5f5f | 3074 | 6869 | 733a | 7028 | 302c | 3130 | 3929 | 005f | 5f30 | 743a | 7028 | 302c | 3230 |
| 3660140 | 2900 | 2e2f | 6878 | 782f | 436f | 756e | 7465 | 722e | 6878 | 7800 | 5f5f | 3074 | 6869 | 7320 | 3a5a | 746c | 005f | 5f30 | 7420 | 3a5a | 746c | 0073 | 6574 | 4e61 |
| 3660220 | 6d65 | 496e | 6465 | 785f | 5f37 | 436f | 756e | 7465 | 7246 | 5063 | 203a | 5a74 | 4600 | 7365 | 745f | 4655 | 5f46 | 696c | 654e | 616d | 655f | 5f38 | 4669 | 6c65 |
| 3660300 | 556e | 6974 | 4650 | 633a | 6628 | 302c | 3229 | 005f | 5f30 | 7468 | 6973 | 3a70 | 2830 | 2c31 | 3135 | 293d | 2a28 | 302c | 3130 | 3429 | 005f | 5f30 | 733a | 7028 |
| 3660360 | 302c | 3230 | 2900 | 2f68 | 6f6d | 652f | 6f73 | 6173 | 312f | 612f | 6162 | 2f73 | 7263 | 2f6e | 6577 | 6f62 | 6a65 | 6374 | 732f | 7072 | 6f67 | 2f68 | 7878 | 2f46 |
| 3660440 | 696c | 6555 | 6e2e | 6878 | 7800 | 5f5f | 3074 | 6869 | 733a | 7228 | 302c | 3131 | 3529 | 005f | 5f30 | 7468 | 6973 | 203a | 5a74 | 6c00 | 5f5f | 3073 | 203a | 5a74 |
| 3660520 | 6c00 | 7365 | 745f | 4655 | 5f46 | 696c | 654e | 616d | 655f | 5f38 | 4669 | 6c65 | 556e | 6974 | 4650 | 6320 | 3a5a | 7446 | 0065 | 7870 | 6c61 | 696e | 5f5f | 3136 |
| 3660600 | 626c | 6f63 | 6b5f | 6174 | 7472 | 6962 | 7574 | 6573 | 4650 | 633a | 6628 | 302c | 3229 | 005f | 5f30 | 7468 | 6973 | 3a70 | 2830 | 2c31 | 3136 | 293d | 2a28 | 302c |
| 3660660 | 3938 | 2900 | 5f5f | 3073 | 3a70 | 2830 | 2c32 | 3029 | 002f | 686f | 6d65 | 2f6f | 7361 | 7331 | 2f61 | 2f61 | 622f | 7372 | 632f | 6e65 | 776f | 626a | 6563 | 7473 |
| 3660740 | 2f70 | 726f | 672f | 6878 | 782f | 6174 | 7472 | 6962 | 7574 | 652e | 6878 | 7800 | 5f5f | 3074 | 6869 | 733a | 7228 | 302c | 3131 | 3629 | 005f | 5f30 | 7468 | 6973 |
| 3661020 | 203a | 5a74 | 6c00 | 5f5f | 3073 | 203a | 5a74 | 6c00 | 6578 | 706c | 6169 | 6e5f | 5f31 | 3662 | 6c6f | 636b | 5f61 | 7474 | 7269 | 6275 | 7465 | 7346 | 5063 | 203a |
| 3661100 | 5a74 | 4600 | 7365 | 745f | 7061 | 7261 | 6d65 | 7465 | 725f | 7661 | 6c75 | 655f | 7479 | 7065 | 5f5f | 3970 | 6172 | 616d | 6574 | 6572 | 4650 | 633a | 6628 | 302c |
| 3661160 | 3229 | 005f | 5f30 | 7468 | 6973 | 3a70 | 2830 | 2c39 | 3729 | 005f | 5f30 | 733a | 7028 | 302c | 3230 | 2900 | 2f68 | 6f6d | 652f | 6f73 | 6173 | 312f | 612f | 6162 |
| 3661240 | 2f73 | 7263 | 2f6e | 6577 | 6f62 | 6a65 | 6374 | 732f | 7072 | 6f67 | 2f68 | 7878 | 2f70 | 6172 | 616d | 6574 | 6572 | 2e68 | 7878 | 005f | 5f30 | 7468 | 6973 | 3a72 |
| 3661320 | 2830 | 2c39 | 3729 | 005f | 5f30 | 7468 | 6973 | 203a | 5a74 | 6c00 | 5f5f | 3073 | 203a | 5a74 | 6c00 | 7365 | 745f | 7061 | 7261 | 6d65 | 7465 | 725f | 7661 | 6c75 |
| 3661400 | 655f | 7479 | 7065 | 5f5f | 3970 | 6172 | 616d | 6574 | 6572 | 4650 | 6320 | 3a5a | 7446 | 0065 | 7870 | 6c61 | 696e | 5f5f | 384c | 504f | 626a | 6563 | 7446 | 5063 |

| | | | | | | | | | | | | | | | | | | | | | | | | |
|---|---|---|---|---|---|---|---|---|---|---|---|---|---|---|---|---|---|---|---|---|---|---|---|---|
| 3661460 | 3a66 | 2830 | 2c32 | 2900 | 5f5f | 3074 | 6869 | 733a | 7028 | 302c | 3131 | 3729 | 312a | 2830 | 2c38 | 3529 | 005f | 5f30 | 733a | 7028 | 302c | 3230 | 2900 | 2f68 |
| 3661540 | 6f6d | 652f | 6f73 | 6173 | 312f | 612f | 6162 | 2f73 | 7263 | 2f6e | 6577 | 6f62 | 6a65 | 6374 | 732f | 6878 | 782f | 4c50 | 4f62 | 6a65 | 6374 | 5f64 | 622e | 6878 |
| 3661620 | 7800 | 5f5f | 3074 | 6869 | 733a | 7228 | 302c | 3131 | 3729 | 005f | 5f30 | 7468 | 6973 | 203a | 5a74 | 6c00 | 5f5f | 3073 | 203a | 5a74 | 6c00 | 6578 | 706c | 6169 |
| 3661700 | 6e5f | 5f38 | 4c50 | 4f62 | 6a65 | 6374 | 4650 | 6320 | 3a5a | 7446 | 0069 | 734c | 5445 | 5f5f | 374e | 4f62 | 6a65 | 6374 | 4650 | 364f | 626a | 6563 | 743a | 6628 |
| 3661760 | 302c | 3129 | 005f | 5f30 | 7468 | 6973 | 3a70 | 2830 | 2c38 | 3629 | 005f | 5f30 | 5f5f | 4133 | 393a | 7028 | 302c | 3131 | 3829 | 3d2a | 2830 | 2c37 | 3929 | 002f |
| 3662040 | 696f | 6d65 | 2f6f | 7361 | 7331 | 2f61 | 2f61 | 622f | 7372 | 632f | 6e65 | 776f | 626a | 6563 | 7473 | 2f68 | 7878 | 2f4e | 4f62 | 6a65 | 6374 | 5f64 | 622e | 6878 |
| 3662120 | 7800 | 5f5f | 3074 | 6869 | 7320 | 3a5a | 746c | 005f | 5f30 | 5f5f | 4133 | 3920 | 3a5a | 746c | 0069 | 734c | 5445 | 5f5f | 374e | 4f62 | 6a65 | 6374 | 4650 | 364f |
| 3662200 | 626a | 6563 | 7420 | 3a5a | 7446 | 0069 | 7347 | 5445 | 5f5f | 374e | 4f62 | 6a65 | 6374 | 4650 | 364f | 626a | 6563 | 743a | 6628 | 302c | 3129 | 005f | 5f30 | 7468 |
| 3662260 | 6973 | 3a70 | 2830 | 2c38 | 3629 | 005f | 5f30 | 5f5f | 4133 | 383a | 7028 | 302c | 3131 | 3829 | 005f | 5f30 | 7468 | 6973 | 203a | 5a74 | 6c00 | 5f5f | 305f | 5f41 |
| 3662340 | 3338 | 203a | 5a74 | 6c00 | 6973 | 4754 | 455f | 5f37 | 4e4f | 626a | 6563 | 7446 | 5036 | 4f62 | 6a65 | 6374 | 203a | 5a74 | 4600 | 7365 | 7450 | 726f | 705f | 5f37 |
| 3662420 | 4e4f | 626a | 6563 | 7446 | 5063 | 663a | 6628 | 302c | 3229 | 005f | 5f30 | 7468 | 6973 | 3a70 | 2830 | 2c38 | 3629 | 005f | 5f31 | 5f5f | 4133 | 353a | 7028 | 302c |
| 3662500 | 3230 | 2900 | 5f5f | 315f | 5f41 | 3337 | 3a70 | 2830 | 2c31 | 3029 | 005f | 5f30 | 7468 | 6973 | 203a | 5a74 | 6c00 | 5f5f | 315f | 5f41 | 3336 | 203a | 5a74 | 6c00 |
| 3662560 | 5f5f | 315f | 5f41 | 3337 | 203a | 5a74 | 6c00 | 7365 | 7450 | 726f | 705f | 5f37 | 4e4f | 626a | 6563 | 7446 | 5063 | 6620 | 3a5a | 7446 | 0073 | 6574 | 5072 | 6f70 |
| 3662640 | 5f5f | 374e | 4f62 | 6a65 | 6374 | 4650 | 6369 | 3a66 | 2830 | 2c32 | 2900 | 5f5f | 3074 | 6869 | 733a | 7028 | 302c | 3836 | 2900 | 5f5f | 315f | 5f41 | 3334 | 3a70 |
| 3662720 | 2830 | 2c32 | 3029 | 005f | 5f31 | 5f5f | 4133 | 353a | 7028 | 302c | 3129 | 005f | 5f30 | 7468 | 6973 | 203a | 5a74 | 6c00 | 5f5f | 315f | 5f41 | 3334 | 203a | 5a74 |
| 3663000 | 6c00 | 5f5f | 315f | 5f41 | 3335 | 203a | 5a74 | 6c00 | 7365 | 7450 | 726f | 705f | 5f37 | 4e4f | 626a | 6563 | 7446 | 5063 | 6920 | 3a5a | 7446 | 0073 | 6574 | 5072 |
| 3663060 | 6f70 | 5f5f | 374e | 4f62 | 6a65 | 6374 | 4650 | 6354 | 313a | 6628 | 302c | 3229 | 005f | 5f30 | 7468 | 6973 | 3a70 | 2830 | 2c38 | 3629 | 005f | 5f31 | 5f5f | 4133 |
| 3663140 | 323a | 7028 | 302c | 3230 | 2900 | 5f5f | 315f | 5f41 | 3333 | 3a70 | 2830 | 2c32 | 3029 | 005f | 5f30 | 7468 | 6973 | 203a | 5a74 | 6c00 | 5f5f | 315f | 5f41 | 3332 |
| 3663220 | 203a | 5a74 | 6c00 | 5f5f | 315f | 5f41 | 3333 | 203a | 5a74 | 6c00 | 7365 | 7450 | 726f | 705f | 5f37 | 4e4f | 626a | 6563 | 7446 | 5063 | 5431 | 203a | 5a74 | 4600 |
| 3663300 | 6765 | 7450 | 726f | 705f | 5f37 | 4e4f | 626a | 6563 | 7446 | 5063 | 693a | 6628 | 302c | 3230 | 2900 | 5f5f | 3074 | 6869 | 733a | 7028 | 302c | 3836 | 2900 | 5f5f |
| 3663360 | 305f | 5f41 | 3330 | 3a70 | 2830 | 2c32 | 3029 | 005f | 5f30 | 5f5f | 4133 | 313a | 7028 | 302c | 3129 | 005f | 5f30 | 7468 | 6973 | 203a | 5a74 | 6c00 | 5f5f | 305f |
| 3663440 | 5f41 | 3330 | 203a | 5a74 | 6c00 | 5f5f | 305f | 5f41 | 3331 | 203a | 5a74 | 6c00 | 6765 | 7450 | 726f | 705f | 5f37 | 4e4f | 626a | 6563 | 7446 | 5063 | 6920 | 3a5a |
| 3663520 | 7446 | 0067 | 6574 | 4174 | 7472 | 5f5f | 374e | 4f62 | 6a65 | 6374 | 4669 | 3a66 | 2830 | 2c32 | 3029 | 005f | 5f30 | 7468 | 6973 | 3a70 | 2830 | 2c38 | 3629 | 005f |
| 3663600 | 5f30 | 5f5f | 4132 | 393a | 7028 | 302c | 3129 | 005f | 5f30 | 7468 | 6973 | 203a | 5a74 | 6c00 | 5f5f | 305f | 5f41 | 3239 | 203a | 5a74 | 6c00 | 6765 | 7441 | 7474 |
| 3663660 | 725f | 5f37 | 4e4f | 626a | 6563 | 7446 | 6920 | 3a5a | 7446 | 0069 | 6e4f | 7264 | 6572 | 5f5f | 364f | 626a | 6563 | 7446 | 5036 | 4f62 | 6a65 | 6374 | 3a66 | 2830 |
| 3663740 | 2c31 | 2900 | 5f5f | 3074 | 6869 | 733a | 7028 | 302c | 3131 | 3829 | 005f | 5f30 | 5f5f | 4132 | 373a | 7028 | 302c | 3131 | 3829 | 002f | 686f | 6d65 | 2f6f | 7361 |
| 3664020 | 7331 | 2f61 | 2f61 | 622f | 7372 | 632f | 6e65 | 776f | 626a | 6563 | 7473 | 2f68 | 7878 | 2f4f | 626a | 6563 | 745f | 6462 | 2e68 | 7878 | 005f | 5f30 | 7468 | 6973 |
| 3664100 | 203a | 5a74 | 6c00 | 5f5f | 305f | 5f41 | 3237 | 203a | 5a74 | 6c00 | 696e | 4f72 | 6465 | 725f | 5f36 | 4f62 | 6a65 | 6374 | 4650 | 364f | 626a | 6563 | 7420 | 3a5a |
| 3664160 | 7446 | 0044 | 6563 | 6f64 | 6572 | 2e6f | 005f | 7365 | 745f | 7061 | 7261 | 6d65 | 7465 | 725f | 7661 | 6c75 | 655f | 7479 | 7065 | 5f5f | 3970 | 6172 | 616d | 6574 |
| 3664240 | 6572 | 4650 | 6300 | 5f73 | 6574 | 5072 | 6f70 | 5f5f | 374e | 4f62 | 6a65 | 6374 | 4650 | 6366 | 005f | 7365 | 7450 | 726f | 705f | 5f37 | 4e4f | 626a | 6563 | 7446 |
| 3664320 | 5063 | 6900 | 5f73 | 6574 | 4e61 | 6d65 | 496e | 6465 | 785f | 5f37 | 4465 | 636f | 6465 | 7246 | 5063 | 005f | 6578 | 706c | 6169 | 6e5f | 5f31 | 3662 | 6c6f | 636b |
| 3664400 | 5f61 | 7474 | 7269 | 6275 | 7465 | 7346 | 5063 | 005f | 6765 | 7441 | 7474 | 725f | 5f37 | 4e4f | 626a | 6563 | 7446 | 6900 | 5f73 | 6574 | 5f46 | 555f | 4669 | 6c65 |
| 3664460 | 4e61 | 6d65 | 5f5f | 3846 | 696c | 6555 | 6e69 | 7446 | 5063 | 005f | 7075 | 745f | 5f37 | 6f73 | 7472 | 6561 | 6d46 | 6300 | 5f73 | 6574 | 5072 | 6f70 | 5f5f | 374e |
| 3664540 | 4f62 | 6a65 | 6374 | 4650 | 6354 | 3100 | 5f69 | 6f73 | 7472 | 6561 | 6d5f | 696e | 6974 | 005f | 6973 | 4c54 | 455f | 5f37 | 4e4f | 626a | 6563 | 7446 | 5036 | 4f62 |
| 3664620 | 6a65 | 6374 | 005f | 6973 | 4754 | 455f | 5f37 | 4e4f | 626a | 6563 | 7446 | 5036 | 4f62 | 6a65 | 6374 | 005f | 6578 | 706c | 6169 | 6e5f | 5f38 | 4c50 | 4f62 | 6a65 |
| 3664700 | 6374 | 4650 | 6300 | 5f67 | 6574 | 5072 | 6f70 | 5f5f | 374e | 4f62 | 6a65 | 6374 | 4650 | 6369 | 005f | 5f5f | 6374 | 5f5f | 3665 | 6e74 | 6974 | 7946 | 7600 | 5f69 |
| 3664760 | 6e4f | 7264 | 6572 | 5f5f | 364f | 626a | 6563 | 7446 | 5036 | 4f62 | 6a65 | 6374 | 002f | 686f | 6d65 | 2f6f | 7361 | 7331 | 2f61 | 2f61 | 622f | 7372 | 632f | 6e65 |
| 3665040 | 776f | 626a | 6563 | 7473 | 2f70 | 726f | 672f | 4d47 | 2f43 | 2b2b | 2e32 | 3238 | 3434 | 2f00 | 4465 | 636f | 6465 | 722e | 6300 | 4465 | 636f | 6465 | 722e | 6378 |
| 3665120 | 7800 | 696e | 743a | 7428 | 302c | 3129 | 3d72 | 2830 | 2c31 | 293b | 2d32 | 3134 | 3734 | 3833 | 3634 | 383b | 3231 | 3437 | 3438 | 3336 | 3437 | 3b00 | 6368 | 6172 |
| 3665200 | 3a74 | 2830 | 2c32 | 293d | 7228 | 302c | 3229 | 3b30 | 3b31 | 3237 | 3b00 | 6c6f | 6e67 | 3a74 | 2830 | 2c33 | 293d | 7228 | 302c | 3129 | 3b2d | 3231 | 3437 | 3438 |
| 3665260 | 3336 | 3438 | 3b32 | 3134 | 3734 | 3833 | 3634 | 373b | 0073 | 686f | 7274 | 3a74 | 2830 | 2c34 | 293d | 7228 | 302c | 3129 | 3b2d | 3332 | 3736 | 383b | 3332 | 3736 |
| 3665340 | 373b | 0075 | 6e73 | 6967 | 6e65 | 6420 | 6368 | 6172 | 3a74 | 2830 | 2c35 | 293d | 7228 | 302c | 3129 | 3b30 | 3b32 | 3535 | 3b00 | 756e | 7369 | 676e | 6564 | 2073 |
| 3665420 | 686f | 7274 | 3a74 | 2830 | 2c36 | 293d | 7228 | 302c | 3129 | 3b30 | 3b36 | 3535 | 3335 | 3b00 | 756e | 7369 | 676e | 6564 | 206c | 6f6e | 673a | 7428 | 302c | 3729 |
| 3665500 | 3d72 | 2830 | 2c31 | 293b | 303b | 2d31 | 3b00 | 756e | 7369 | 676e | 6564 | 2069 | 6e74 | 3a74 | 2830 | 2c38 | 293d | 7228 | 302c | 3129 | 3b30 | 3b2d | 313b | 0066 |
| 3665560 | 6c6f | 6174 | 3a74 | 2830 | 2c39 | 293d | 7228 | 302c | 3129 | 3b34 | 3b30 | 3b00 | 646f | 7562 | 6c65 | 3a74 | 2830 | 2c31 | 3029 | 3d72 | 2830 | 2c31 | 293b | 383b |
| 3665640 | 303b | 0076 | 6f69 | 643a | 7428 | 302c | 3131 | 293d | 2830 | 2c31 | 3129 | 003f | 3f3f | 3a74 | 2830 | 2c31 | 3229 | 3d28 | 302c | 3129 | 005f | 5f76 | 7074 | 703a |
| 3665720 | 7428 | 302c | 3133 | 293d | 2a28 | 302c | 3134 | 293d | 6628 | 302c | 3129 | 005f | 5f6d | 7074 | 723a | 5428 | 302c | 3135 | 293d | 7338 | 643a | 2830 | 2c34 | 292c |
| 3666000 | 302c | 3136 | 3b69 | 3a28 | 302c | 3429 | 2c31 | 362c | 3136 | 3b66 | 3a28 | 302c | 3133 | 292c | 3332 | 2c33 | 323b | 3b00 | 5f50 | 4656 | 5f3a | 7428 | 302c | 3136 |
| 3666060 | 293d | 2a28 | 302c | 3137 | 293d | 6628 | 302c | 3229 | 005f | 5046 | 495f | 3a74 | 2830 | 2c31 | 3329 | 0065 | 7272 | 6e6f | 3a47 | 2830 | 2c31 | 2900 | 7379 | 735f |
| 3666140 | 6e65 | 7272 | 3a47 | 2830 | 2c31 | 2900 | 656e | 7669 | 726f | 6e3a | 4728 | 302c | 3139 | 293d | 2a28 | 302c | 3230 | 293d | 2a28 | 302c | 3229 | 0065 | 6e64 | 3a47 |
| 3666220 | 2830 | 2c31 | 2900 | 6574 | 6578 | 743a | 4728 | 302c | 3129 | 0065 | 6461 | 7461 | 3a47 | 2830 | 2c31 | 2900 | 6f70 | 7461 | 7267 | 3a47 | 2830 | 2c32 | 3029 | 006f |
| 3666300 | 7074 | 696e | 643a | 4728 | 302c | 3129 | 006f | 7074 | 6572 | 723a | 4728 | 302c | 3129 | 0070 | 7472 | 6469 | 6666 | 5f74 | 3a74 | 2830 | 2c31 | 2900 | 7369 | 7a65 |
| 3666360 | 5f74 | 3a74 | 2830 | 2c38 | 2900 | 7374 | 7265 | 616d | 706f | 733a | 7428 | 302c | 3129 | 0073 | 7472 | 6561 | 6d6f | 6666 | 3a74 | 2830 | 2c31 | 2900 | 696f | 5f73 |
| 3666440 | 7461 | 7465 | 3a54 | 2830 | 2c32 | 3129 | 3d65 | 676f | 6f64 | 6269 | 745f | 5f69 | 6f5f | 7374 | 6174 | 653a | 302c | 656f | 6662 | 6974 | 5f5f | 696f | 5f73 | 7461 |
| 3666520 | 7465 | 3a31 | 2c66 | 6169 | 6c62 | 6974 | 5f5f | 696f | 5f73 | 7461 | 7465 | 3a32 | 2c62 | 6164 | 6269 | 745f | 5f69 | 6f5f | 7374 | 6174 | 653a | 332c | 6861 | 7264 |

3666600 6661 696c 5f5f 696f 5f73 7461 7465 3a34 2c3b 006f 7065 6e5f 6d6f 6465 3a54 2830 2c32 3229 3165 696e 5f5f 6f70 656e 5f6d
3666660 6f64 653a 302c 6f75 745f 5f6f 7065 6e5f 6d6f 6465 3a31 2c61 7465 5f5f 6f70 656e 5f6d 6f64 653a 322c 6170 705f 5f6f 7065
3666740 6e5f 6d6f 6465 3a33 2c74 7275 6e63 5f5f 6f70 656e 5f6d 6f64 653a 342c 6e6f 6372 6561 7465 5f5f 6f70 656e 5f6d 6f64 653a
3667020 352c 6e6f 7265 706c 6163 655f 5f6f 7065 6e5f 6d6f 6465 3a36 2c3b 0073 6565 6b5f 6469 723a 5428 302c 3233 293d 6562 6567
3667100 5f5f 7365 656b 5f64 6972 3a30 2c63 7572 5f5f 7365 656b 5f64 6972 3a31 2c65 6e64 5f5f 7365 656b 5f64 6972 3a32 2c3b 005f
3667160 5f45 313a 5428 302c 3234 293d 6573 6b69 7077 735f 5f5f 5f45 313a 302c 6c65 6674 5f5f 5f5f 4531 3a31 2c72 6967 6874 5f5f
3667240 5f5f 4531 3a32 2c69 6e74 6572 6e61 6c5f 5f5f 5f45 313a 332c 6465 635f 5f5f 5f45 313a 342c 6f63 745f 5f5f 5f45 313a 352c
3667320 6865 785f 5f5f 5f45 313a 362c 7368 6f77 6261 7365 5f5f 5f5f 4531 3a37 2c5c 0073 686f 7770 6f69 6e74 5f5f 5f5f 4531 3a38
3667400 2c75 7070 6572 6361 7365 5f5f 5f5f 4531 3a39 2c73 686f 7770 6f73 5f5f 5f5f 4531 3a31 302c 7363 6965 6e74 6966 6963 5f5f
3667460 5f5f 4531 3a31 312c 6669 7865 645f 5f5f 5f45 313a 3132 2c75 6e69 7462 7566 5f5f 5f5f 4531 3a31 332c 7374 6469 6f5f 5f5f
3667540 5f45 313a 3134 2c3b 005f 5f45 323a 5428 302c 3235 293d 6573 6b69 7070 696e 675f 5f5f 5f45 323a 302c 7469 6564 5f5f 5f5f
3667620 4532 3a31 2c3b 0069 6f73 3a54 2830 2c32 3629 3d73 3630 6e75 7365 725f 5f33 696f 733a 2830 2c31 292c 302c 3332 3b78 5f75
3667700 7365 725f 5f33 696f 733a 2830 2c33 3029 3d2a 2830 2c32 3729 3b78 7569 6f73 5f75 7365 725f 756e 696f 6e3a 2c33 322c 3332
3667760 3b62 705f 5f33 696f 733a 2830 2c33 3129 3d2a 2830 2c32 3829 3b78 7373 7472 6561 6d62 7566 3a2c 3634 2c33 323b 7374 6174
3670040 655f 5f33 696f 733a 2830 2c31 292c 3936 2c33 323b 6973 7065 6369 616c 5f5f 3369 6f73 3a28 302c 3129 2c31 3238 2c33 323b
3670120 6f73 7065 6369 616c 5f5f 3369 6f73 3a28 302c 3129 2c31 3630 2c33 323b 6973 6678 5f73 7065 6369 616c 5f5f 3369 6f73 3a28
3670200 302c 3129 2c31 3932 2c33 323b 6f73 6678 5f73 7065 6369 616c 5f5f 3369 6f73 3a28 302c 3129 2c32 3234 2c33 323b 5c00 6465
3670260 6c62 7566 5f5f 3369 6f73 3a28 302c 3129 2c32 3536 2c33 323b 785f 7469 655f 5f33 696f 733a 2830 2c33 3229 3d2a 2830 2c32
3670340 3929 3d78 736f 7174 7265 616d 3a2c 3238 382c 3332 3b78 5f66 6c61 6773 5f5f 3369 6f73 3a28 302c 3129 2c33 3230 2c33 323b
3670420 785f 7072 6563 6973 696f 6e5f 5f33 696f 733a 2830 2c34 292c 3335 322c 3136 3b78 5f66 696c 6c5f 5f33 696f 733a 2830 2c32
3670500 292c 3336 382c 333b 785f 7769 6474 685f 5f33 696f 733a 2830 2c34 292c 3338 342c 3136 3b61 7373 6967 6e5f 7072 6976 6174
3670560 655f 5f33 696f 733a 2830 2c31 292c 3431 362c 3332 3b5f 5f76 7074 725f 5f33 696f 733a 2830 2c33 3329 3d2a 2830 2c31 3529
3670640 2c34 3438 2c33 323b 3b00 6261 7365 6669 656c 645f 5f33 696f 733a 4728 302c 3129 0061 646a 7573 7466 6965 6c64 5f5f 3369
3670720 6f73 3a47 2830 2c31 2900 666c 6f61 7466 6965 6c64 5f5f 3369 6f73 3a47 2830 2c31 2900 6e65 7874 6269 745f 5f33 696f 733a
3671000 4728 302c 3129 006e 6578 7477 6f72 645f 5f33 696f 733a 4728 302c 3129 0073 7464 696f 666c 7573 685f 5f33 696f 733a 4728
3671060 302c 3136 2900 696f 733a 5a63 596f 733b 3b5f 5f63 745f 5f33 696f 7346 5039 7374 7265 616d 6275 6620 5f5f 6374 5f5f 3369
3671140 6f73 4676 205f 5f63 745f 5f33 696f 7346 5233 696f 7320 5f5f 6474 5f5f 3369 6f73 4676 2066 6c61 6773 5f5f 3369 6f73 4676
3671220 2066 6c61 6773 5f5f 3369 6f73 466c 2073 6574 665f 5f33 696f 7346 6c54 3120 7365 7466 5f5f 3369 6f73 466c 2075 6e73 6574
3671300 665f 5f33 696f 7346 6c20 7769 6474 685f 5f33 696f 7346 7620 7769 6474 685f 5f33 696f 7346 6920 7469 655f 5f33 696f 7346
3671360 5037 6f73 7472 6561 6d20 5c00 7469 655f 5f33 696f 7346 7620 6669 6c6c 5f5f 3369 6f73 4663 2066 696c 6c5f 5f33 696f 7346
3671440 7620 7072 6563 6973 696f 6e5f 5f33 696f 7346 6920 7072 6563 6973 696f 6e5f 5f33 696f 7346 7620 7264 7374 6174 655f 5f33
3671520 696f 7346 7620 5f5f 6f70 5076 5f5f 3369 6f73 4676 205f 5f6e 745f 5f33 696f 7346 7620 656f 665f 5f33 696f 7346 7620 6661
3671600 696c 5f5f 3369 6f73 4676 2062 6164 5f5f 3369 6f73 4676 2067 6f6f 645f 5f33 696f 7346 7620 636c 6561 725f 5f33 696f 7346
3671660 6920 7264 6275 665f 5f33 696f 7346 7620 5c00 6977 6f72 645f 5f33 696f 7346 6920 7077 6f72 645f 5f33 696f 7346 6920 6269
3671740 7461 6c6c 6f63 5f5f 3369 6f73 5346 7620 7861 6c6c 6f63 5f5f 3369 6f73 5346 7620 7572 6573 697a 655f 5f33 696f 7346 6920
3672020 7379 6e63 5f77 6974 685f 7374 6469 6f5f 5f33 696f 7353 4676 2073 6574 7374 6174 655f 5f33 696f 7346 6920 696e 6974 5f5f
3672100 3369 6f73 4650 3973 7472 6561 6d62 7566 205f 5f61 735f 5f33 696f 7346 5233 696f 7320 736b 6970 5f5f 3369 6f73 4669 203b
3672160 6261 7365 6669 656c 645f 5f33 696f 7320 5c00 6164 6a75 7374 6669 656c 645f 5f33 696f 7320 666c 6f61 7466 6965 6c64 5f5f
3672240 3369 6f73 206e 6578 7462 6974 5f5f 3369 6f73 206e 6578 7477 6f72 645f 5f33 696f 7320 7374 6469 6f66 6c75 7368 5f5f 3369
3672320 6f73 203b 3b00 7374 7265 616d 6275 663a 5428 302c 3238 293d 7334 3361 6c6c 6f63 5f5f 3973 7472 6561 6d62 7566 3a28 302c
3672400 3429 2c30 2c31 363b 785f 756e 6275 665f 5f39 7374 7265 616d 6275 663a 2830 2c34 292c 3136 2c31 363b 785f 6261 7365 5f5f
3672460 3973 7472 6561 6d62 7566 3a28 302c 3230 292c 3332 2c33 323b 785f 7062 6173 655f 5f39 7374 7265 616d 6275 663a 2830 2c32
3672540 3029 2c36 342c 3332 3b78 5f70 7074 725f 5f39 7374 7265 616d 6275 663a 2830 2c32 3029 2c39 362c 3332 3b78 5f65 7070 7472
3672620 5f5f 3973 7472 6561 6d62 7566 3a28 302c 3230 292c 3132 382c 3332 3b78 5f67 7074 725f 5f39 7374 7265 616d 6275 663a 2830
3672700 2c32 3029 2c31 3630 2c33 323b 785f 6567 7074 725f 5f39 7374 7265 616d 6275 663a 2830 2c32 3029 2c31 3932 2c33 323b 5c00
3672760 785f 6562 6163 6b5f 5f39 7374 7265 616d 6275 663a 2830 2c32 3029 2c32 3234 2c33 323b 785f 626c 656e 5f5f 3973 7472 6561
3673040 6d62 7566 3a28 302c 3129 2c32 3536 2c33 323b 5f5f 7670 7472 5f5f 3973 7472 6561 6d62 7566 3a28 302c 3333 292c 3238 382c
3673120 3332 3b3b 0073 7472 6561 6d62 7566 3a5a 6373 7472 6561 6d62 7566 3b3b 5f5f 6374 5f5f 3973 7472 6561 6d62 7566 4652 3973
3673200 7472 6561 6d62 7566 205f 5f63 745f 5f39 7374 7265 616d 6275 6646 7620 5f5f 6374 5f5f 3973 7472 6561 6d62 7566 4650 6369
3673260 205f 5f63 745f 5f39 7374 7265 616d 6275 6646 5063 6954 3220 5f5f 6173 5f5f 3973 7472 6561 6d62 7566 4652 3973 7472 6561
3673340 6d62 7566 2064 6270 5f5f 3973 7472 6561 6d62 7566 4676 2062 6173 655f 5f39 7374 7265 616d 6275 6646 7620 7062 6173 655f
3673420 5f39 7374 7265 616d 6275 6646 7620 5c00 7070 7472 5f5f 3973 7472 6561 6d62 7566 4676 2065 7070 7472 5f5f 3973 7472 6561
3673500 6d62 7566 4676 2067 7074 725f 5f39 7374 7265 616d 6275 6646 7620 6567 7074 725f 5f39 7374 7265 616d 6275 6646 7620 6562
3673560 6163 6b5f 5f39 7374 7265 616d 6275 6646 7620 6562 7566 5f5f 3973 7472 6561 6d62 7566 4676 2062 6c65 6e5f 5f39 7374 7265
3673640 616d 6275 6646 7620 7365 7470 5f5f 3973 7472 6561 6d62 7566 4650 6354 3120 7365 7467 5f5f 3973 7472 6561 6d62 7566 4650

```
3673720 6d4e 3231 2070 6275 6d70 5f5f 3973 7472 6561 6d62 7566 4669 205c 0067 6275 6d70 5f5f 3973 7472 6561 6d62 7566 4669 2073
3674000 6574 625f 5f39 7374 7265 616d 6275 6646 5063 5431 6920 756e 6275 6666 6572 6564 5f5f 3973 7472 6561 6d62 7566 4676 2075
3674060 6e62 7566 6665 7265 645f 5f39 7374 7265 6161 6275 6646 6920 616c 6c6f 6361 7465 5f5f 3973 7472 6561 6d62 7566 4676 2064
3674140 6f61 6c6c 6f63 6174 655f 5f39 7374 7265 616d 6275 6646 7620 6f76 6572 666c 6f77 5f5f 3973 7472 6561 6d62 7566 4669 2075
3674220 6e64 6572 666c 6f77 5f5f 3973 7472 6561 6d62 7566 4676 205c 0070 6261 636b 6661 696c 5f5f 3973 7472 6561 6d62 7566 4669
3674300 2073 796e 635f 5f39 7374 7265 616d 6275 6646 7620 7365 656b 6f66 665f 5f39 7374 7265 616d 6275 6646 6c30 7365 656b 5f64
3674360 6972 6920 7365 656b 706f 735f 5f39 7374 7265 616d 6275 6646 6c69 2078 7370 7574 6e5f 5f39 7374 7265 616d 6275 6646 5043
3674440 6369 2078 7367 6574 6e5f 5f39 7374 7265 616d 6275 6646 5063 6920 696e 5f61 7661 696c 5f5f 3973 7472 6561 6d62 7566 4676
3674520 206f 7574 5f77 6169 7469 6e67 5f5f 3973 7472 6561 6162 7566 4676 205c 0073 6765 7463 5f5f 3973 7472 6561 6162 7566 4676
3674600 2073 6e65 7874 635f 5f39 7374 7265 616d 6275 6646 7620 7362 756d 7063 5f5f 3973 7472 6561 6d62 7566 4676 2073 746f 7373
3674660 635f 5f39 7374 7265 616d 6275 6646 7620 7370 7574 6261 636b 635f 5f39 7374 7265 616d 6275 6646 6320 7370 7574 635f 5f39
3674740 7374 7265 616d 6275 6646 6920 7370 7574 6e5f 5f39 7374 7265 616d 6275 6646 5043 6369 2073 6765 746e 5f5f 3973 7472 6561
3675020 6d62 7566 4650 6369 2073 6574 6275 665f 5f39 7374 7265 616d 6275 6646 5063 6920 5c00 7365 7462 7566 5f5f 3973 7472 6561
3675100 6d62 7566 4650 5563 6920 7365 7462 7566 5f5f 3973 7472 6561 6d62 7566 4650 6369 5432 205f 5f64 745f 5f39 7374 7265 616d
3675160 6275 6646 7620 785f 736e 6578 7463 5f5f 3973 7472 6561 6d62 7566 4676 203b 3b3b 0069 7374 7265 616d 3a54 2830 2c33 3429
3675240 3473 3732 785f 6763 6f75 6e74 5f5f 3769 7374 7265 616d 3a28 302c 3129 2c30 2c33 323b 5f5f 7670 7472 5f5f 3769 7374 7265
3675320 616d 3a28 302c 3333 292c 3332 2c33 323b 5069 6f73 3a28 302c 3335 2931 2a28 302c 3236 292c 3634 2c33 323b 4f69 6f73 3a28
3675400 302c 3236 292c 3936 2c34 3830 3b3b 0069 7374 7265 616d 3a5a 6369 7374 7265 616d 3b69 6f73 3b5f 5f63 745f 5f37 6973 7472
3675460 6561 6d46 5039 7374 7265 616d 6275 6620 5f5f 6374 5f5f 3769 7374 7265 616d 4676 205f 5f63 745f 5f37 6973 7472 6561 6d46
3675540 5039 7374 7265 616d 6275 6669 5037 6f73 7472 6561 6d20 5f5f 6374 5f5f 3769 7374 7265 616d 4669 5063 5431 205f 5f63 745f
3675620 5f37 6973 7472 6561 6d46 6954 3150 376f 7374 7265 616d 205f 5f63 745f 5f37 6973 7472 6561 6d46 5237 6973 7472 6561 6d20
3675700 5f5f 6474 5f5f 3769 7374 7265 616d 4676 205c 0069 7066 785f 5f37 6973 7472 6561 6d46 6920 6973 6678 5f5f 3769 7374 7265
3675760 616d 4676 2073 6565 6b67 5f5f 3769 7374 7265 616d 466c 2073 6565 6b67 5f5f 3769 7374 7265 616d 466c 3873 6565 6b5f 6469
3676040 7220 7465 6c6c 675f 5f37 6973 7472 6561 6d46 7620 5f5f 7273 5f5f 3769 7374 7265 616d 4650 4652 3769 7374 7265 616d 5f52
3676120 3769 7374 7265 616d 205f 5f72 735f 5f37 6973 7472 6561 6d46 5046 5233 696f 735f 5233 696f 7320 5f5f 7273 5f5f 3769 7374
3676200 7265 616d 4650 6320 5f5f 7273 5f5f 3769 7374 7265 616d 4650 5563 205c 005f 5f72 735f 5f37 6973 7472 6561 6d46 5255 6320
3676260 5f5f 7273 5f5f 3769 7374 7265 616d 4652 6320 5f5f 7273 5f5f 3769 7374 7265 616d 4652 7320 5f5f 7273 5f5f 3769 7374 7265
3676340 616d 4652 6920 5f5f 7273 5f5f 3769 7374 7265 616d 4652 6c20 5f5f 7273 5f5f 3769 7374 7265 616d 4652 5573 205f 5f72 735f
3676420 5f37 6973 7472 6561 6d46 5255 6920 5f5f 7273 5f5f 3769 7374 7265 616d 4652 556c 205f 5f72 735f 5f37 6973 7472 6561 6d46
3676500 5266 205f 5f72 735f 5f37 6973 7472 6561 6d46 5264 205f 5f72 735f 5f37 6973 7472 6561 6d46 5039 7374 7265 616d 6275 6620
3676560 5c00 6765 745f 5f37 6973 7472 6561 6d46 5063 6963 2067 6574 5f5f 3769 7374 7265 616d 4650 5563 6963 2067 6574 5f5f 3769
3676640 7374 7265 616d 4652 3973 7472 6561 6d62 7566 6320 6765 745f 5f37 6973 7472 6561 6d46 5255 6320 6765 745f 5f37 6973 7472
3676720 6561 6d46 5263 2067 6574 5f5f 3769 7374 7265 616d 4676 2067 6574 6c69 6e65 5f5f 3769 7374 7265 616d 4650 6369 6320 6765
3677000 746c 696e 655f 5f37 6973 7472 6561 6d46 5055 6369 6320 7065 656b 5f5f 3769 7374 7265 616d 4676 2069 676e 6f72 655f 5f37
3677060 6973 7472 6561 6d46 6954 3120 5c00 7265 6164 5f5f 3769 7374 7265 616d 4650 6369 2072 6561 645f 5f37 6973 7472 6561 6d46
3677140 5055 6369 2067 636f 756e 745f 5f37 6973 7472 6561 6d46 7620 7075 7462 6163 6b5f 5f37 6973 7472 6561 6d46 6320 7379 6e63
3677220 5f5f 3769 7374 7265 616d 4676 2064 6f5f 6970 6678 5f5f 3769 7374 7265 616d 4669 2065 6174 7768 6974 655f 5f37 6973 7472
3677300 6561 6d46 7620 7867 6574 5f5f 3769 7374 7265 616d 4650 6320 3b3b 3b00 6f73 7472 6561 6d3a 5428 302c 3239 293d 7336 385f
3677360 5f76 7074 725f 5f37 6f73 7472 6561 6d3a 2830 2c33 3329 2c30 2c33 323b 5069 6f73 3a28 302c 3335 292c 3332 2c33 323b 4f69
3677440 6f73 3a28 302c 3236 292c 3634 2c34 3830 3b3b 006f 7374 7265 616d 3a5a 636f 7374 7265 616d 3b69 6f73 3b5f 5f63 745f 5f37
3677520 6f73 7472 6561 6d46 5039 7374 7265 616d 6275 6620 5f5f 6374 5f5f 376f 7374 7265 616d 4676 205f 5f63 745f 5f37 6f73 7472
3677600 6561 6d46 6920 5f5f 6374 5f5f 376f 7374 7265 616d 4669 5063 205f 5f63 745f 5f37 6f73 7472 6561 6d46 5237 6f73 7472 6561
3677660 6d20 5f5f 6474 5f5f 376f 7374 7265 616d 4676 206f 7066 785f 5f37 6f73 7472 6561 6d46 7620 6f73 6678 5f5f 376f 7374 7265
3677740 616d 4676 2066 6c75 7368 5f5f 376f 7374 7265 616d 4676 205c 0073 6565 6b70 5f5f 376f 7374 7265 616d 466c 2073 6565 6b70
3700020 5f5f 376f 7374 7265 616d 466c 3373 6565 6b5f 6469 7220 7465 6c6c 705f 5f37 6f73 7472 6561 6d46 7620 7075 745f 5f37 6f73
3700100 7472 6561 6d46 6320 5f5f 6c73 5f5f 376f 7374 7265 616d 4663 205f 5f6c 735f 5f37 6f73 7472 6561 6d46 5563 205f 5f6c 735f
3700160 5f37 6f73 7472 6561 6d46 5043 6320 5f5f 6c73 5f5f 376f 7374 7265 6161 4669 205f 5f6c 735f 5f37 6f73 7472 6561 6d46 6c20
3700240 5f5f 6c73 5f5f 376f 7374 7265 616d 4664 205f 5f6c 735f 5f37 6f73 7472 6561 6d46 6620 5c00 5f5f 6c73 5f5f 376f 7374 7265
3700320 616d 4655 6920 5f5f 6c73 5f5f 376f 7374 7265 616d 4655 6c20 5f5f 6c73 5f5f 376f 7374 7265 616d 4650 7620 5f5f 6c73 5f5f
3700400 376f 7374 7265 616d 4650 3973 7472 6561 6d62 7566 205f 5f6c 735f 5f37 6f73 7472 6561 6d46 7320 5f5f 6c73 5f5f 376f 7374
3700460 7265 616d 4655 7320 5f5f 6c73 5f5f 376f 7374 7265 616d 4650 4652 376f 7374 7265 616d 5f52 376f 7374 7265 616d 205f 5f6c
3700540 735f 5f37 6f73 7472 6561 6d46 5046 5233 696f 735f 5233 696f 7320 7772 6974 655f 5f37 6f73 7472 6561 6d46 5043 6369 205c
3700620 0077 7269 7465 5f5f 376f 7374 7265 616d 4650 4355 6369 2064 6f5f 6f70 6678 5f5f 376f 7374 7265 616d 4676 2064 6f5f 6f73
3700700 6678 5f5f 376f 7374 7265 6161 4676 203b 3b3b 0070 7574 5f5f 376f 7374 7265 616d 4663 3a66 2830 2c33 3629 3d2a 2830 2c32
3700760 3929 005f 5f30 7468 6973 3a70 2930 2c33 3629 005f 5f30 633a 7028 302c 3229 002f 7573 722f 4343 2f73 756e 342f 696e 636c
```

```
3701040  2f69 6f73 7472 6561 6d2e 6800 5f5f 3074 6869 733a 7228 302c 3336 2900 5f5f 3074 6869 7320 3a5a 746c 005f 5f30 6320 3a5a
3701120  746c 0070 7574 5f5f 376f 7374 7265 616d 4663 203a 5a74 4600 696f 7374 7265 616d 3a54 2830 2c33 3729 3d73 3830 785f 6763
3701200  6f75 6e74 5f5f 3769 7374 7265 616d 3a28 302c 3129 2c30 2c33 323b 5f5f 7670 7472 5f5f 3769 7374 7265 616d 3a28 302c 3333
3701260  292c 3332 2c33 323b 5069 6f73 3a28 302c 3335 292c 3634 2c33 323b 4f6f 7374 7265 616d 3a28 302c 3239 292c 3936 2c35 3434
3701340  3b3b 0069 6f73 7472 6561 6d3a 5a63 696f 7374 7265 616d 3b69 7374 7265 616d 206f 7374 7265 616d 2069 6f73 3b5f 5f63 745f
3701420  5f38 696f 7374 7265 616d 4650 3973 7472 6561 6d62 7566 205f 5f63 745f 5f38 696f 7374 7265 616d 4676 205f 5f63 745f 5f38
3701500  696f 7374 7265 616d 4652 3869 6f73 7472 6561 6d20 5f5f 6474 5f5f 3869 6f73 7472 6561 6d46 7620 3b3b 3b00 6369 6e3a 4728
3701560  302c 3338 293d 7873 6973 7472 6561 6d5f 7769 7468 6173 7369 676e 3a00 636f 7574 3a47 2830 2c33 3929 3d78 736f 7374 7265
3701640  616d 5f77 6974 6961 7373 6967 6e3a 0c63 6572 723a 4728 302c 3339 2900 636c 6f67 3a47 2830 2c33 3929 0049 6f73 7472 6561
3701720  615f 696e 6974 3a54 2830 2c34 3029 3d73 315f 5f57 395f 5f31 3349 6f73 7472 6561 6d5f 696e 6974 3a28 302c 3229 2c30 2c38
3702000  3b3b 0073 7464 7374 6174 7573 5f5f 3133 496f 7374 7265 616d 5f69 6e69 743a 4728 302c 3129 0069 6e69 7463 6f75 6e74 5f5f
3702060  3133 496f 7374 7265 616d 5f69 6e69 743a 4728 302c 3129 0049 6f73 7472 6561 6d5f 696e 6974 3a5a 6349 6f73 7472 6561 6d5f
3702140  696e 6974 3b3b 5f5f 6374 5f5f 3133 496f 7374 7265 616d 5f69 6e69 7446 7620 5f5f 6474 5f5f 3133 496f 7374 7265 616d 5f69
3702220  6e69 7446 7620 3b73 7464 7374 6174 7573 5f5f 3133 496f 7374 7265 616d 5f69 6e69 7420 696e 6974 636f 756e 745f 5f31 3349
3702300  6f73 7472 6561 6d5f 696e 6974 203b 4069 6f73 3b00 696f 7374 7265 616d 5f69 6e69 743a 5328 302c 3430 2900 4750 543a 7428
3702360  302c 3133 2900 736d 616e 6970 5f69 6e74 3a54 2830 2c34 3129 3d73 3866 6374 5f5f 3130 736d 616e 6970 5f69 6e74 3a28 302c
3702440  3432 293d 2a28 302c 3433 293d 6628 302c 3335 292c 302c 3332 3b61 7267 5f5f 3130 736d 616e 6970 5f69 6e74 3a28 302c 3129
3702520  2c33 322c 3332 3b3b 0073 6d61 6e69 705f 696e 743a 5a63 736d 616e 6970 5f69 6e74 3b3b 5f5f 6374 5f5f 3130 736d 616e 6970
3702600  5f69 6e74 4650 4652 3369 6f73 695f 5233 696f 7369 203b 3b5f 5f6c 735f 5f46 5237 6f73 7472 6561 6d52 3130 736d 616e 6970
3702660  5f69 6e74 205f 5f72 735f 5f46 5237 6973 7472 6561 6d52 3130 736d 616e 6970 5f69 6e74 203b 0073 6170 706c 795f 696e 743a
3702740  5428 302c 3434 293d 7334 6663 745f 5f31 3073 6170 706c 795f 696e 743a 2830 2c34 3229 2c30 2c33 323b 3b00 7361 7070 6c79
3703020  5f69 6e74 3a5a 6373 6170 706c 795f 696e 743b 3b5f 5f63 745f 5f31 3073 6170 706c 795f 696e 7446 5046 5233 696f 7369 5f52
3703100  3369 6f73 205f 5f63 6c5f 5f31 3073 6170 706c 795f 696e 7446 6920 3b3b 3b00 696d 616e 6970 5f69 6e74 3a54 2830 2c34 3529
3703160  3473 3966 6374 5f5f 3130 696d 616e 6970 5f69 6e74 3a28 302c 3436 293d 2a28 302c 3437 293d 6628 302c 3438 293d 2a28 302c
3703240  3334 292c 302c 3332 3b61 7267 5f5f 3130 696d 616e 6970 5f69 6e74 3a28 302c 3129 2c33 322c 3332 3b3b 0069 6d61 6e69 705f
3703320  696e 743a 5a63 696d 616e 6970 5f69 6e74 3b3b 5f5f 6374 5f5f 3130 696d 616e 6970 5f69 6e74 4650 4652 3769 7374 7265 616d
3703400  695f 5237 6973 7472 6561 6d69 203b 3b5f 5f72 735f 5f46 5237 6973 7472 6561 6d52 3130 696d 616e 6970 5f69 6e74 203b 0069
3703460  6170 706c 795f 696e 743a 5428 302c 3439 293d 7334 6663 745f 5f31 3069 6170 706c 795f 696e 743a 2830 2c34 3629 2c30 2c33
3703540  323b 3b00 6961 7070 6c79 5f69 6e74 3a5a 6369 6170 706c 795f 696e 743b 3b5f 5f63 745f 5f31 3069 6170 706c 795f 696e 7446
3703620  5046 5237 6973 7472 6561 6d69 5f52 3769 7374 7265 616d 205f 5f63 6c5f 5f31 3069 6170 706c 795f 696e 7446 6920 3b3b 3b00
3703700  6f6d 616e 6970 5f69 6e74 3a54 2830 2c35 3029 3d73 3866 6374 5f5f 3130 6f6d 616e 6970 5f69 6e74 3a28 302c 3531 293d 2a28
3703760  302c 3532 293d 6628 302c 3336 292c 302c 3332 3b61 7267 5f5f 3130 6f6d 616e 6970 5f69 6e74 3a28 302c 3129 2c33 322c 3332
3704040  3b3b 006f 6d61 6e69 705f 696e 743a 5a63 6f6d 616e 6970 5f69 6e74 3b3b 5f5f 6374 5f5f 3130 6f6d 616e 6970 5f69 6e74 4650
3704120  4652 376f 7374 7265 616d 695f 5237 6f73 7472 6561 6d69 203b 3b5f 5f6c 735f 5f46 5237 6f73 7472 6561 6d52 3130 6f6d 616e
3704200  6970 5f69 6e74 203b 006f 6170 706c 795f 696e 743a 5428 302c 3533 293d 7334 6663 745f 5f31 306f 6170 706c 795f 696e 743a
3704260  2830 2c35 3129 2c30 2c33 323b 3b00 6f61 7070 6c79 5f69 6e74 3a5a 636f 6170 706c 795f 696e 743b 3b5f 5f63 745f 5f31 306f
3704340  6170 706c 795f 696e 7446 5046 5237 6f73 7472 6561 6d69 5f52 376f 7374 7265 616d 205f 5f63 6c5f 5f31 306f 6170 706c 795f
3704420  696e 7446 6920 3b3b 3b00 696f 6d61 6e69 705f 696e 743a 5428 302c 3534 293d 7338 6663 745f 5f31 3169 6f6d 616e 6970 5f69
3704500  6e74 3a28 302c 3535 293d 2a28 302c 3536 293d 6628 302c 3537 293d 2a28 302c 3337 292c 302c 3332 3b61 7267 5f5f 3131 696f
3704560  6d61 6e69 705f 696e 743a 2830 2c31 292c 3332 2c33 323b 3b00 696f 6d61 6e69 705f 696e 743a 5a63 696f 6d61 6e69 705f 696e
3704640  743b 3b5f 5f63 745f 5f31 3169 6f6d 616e 6970 5f69 6e74 4650 4652 3869 6f73 7472 6561 6d69 5f52 3869 6f73 7472 6561 6d69
3704720  203b 3b5f 5f6c 735f 5f46 5238 696f 7374 7265 616d 5231 3169 6f6d 616e 6970 5f69 6e74 205f 5f72 735f 5f46 5238 696f 7374
3705000  7265 616d 5231 3169 6f6d 616e 6970 5f69 6e74 203b 0069 6f61 7070 6c79 5f69 6e74 3a54 2830 2c35 3829 3d73 3466 6374 5f5f
3705060  3131 696f 6170 706c 795f 696e 743a 2830 2c35 3529 2c30 2c33 323b 3b00 696f 6170 706c 795f 696e 743a 5a63 696f 6170 706c
3705140  795f 696e 743b 3b5f 5f63 745f 5f31 3169 6f61 7070 6c79 5f69 6e74 4650 4652 3869 6f73 7472 6561 6d69 5f52 3869 6f73 7472
3705220  6561 6d20 5f5f 636c 5f5f 3131 696f 6170 706c 795f 696e 7446 6920 3b3b 3b00 736d 616e 6970 5f6c 6f6e 673a 5428 302c 3539
3705300  293d 7338 6663 745f 5f31 3173 6d61 6e69 705f 6c6f 6e67 3a28 302c 3432 292c 302c 3332 3b61 7267 5f5f 3131 736d 616e 6970
3705360  5f6c 6f6e 673a 2830 2c31 292c 3332 2c33 323b 3b00 736d 616e 6970 5f6c 6f6e 673a 5a63 736d 616e 6970 5f6c 6f6e 673b 3b5f
3705440  5f63 745f 5f31 3173 6d61 6e69 705f 6c6f 6e67 4650 4652 3369 6f73 6c5f 5233 696f 736c 203b 3b5f 5f6c 735f 5f46 5237 6f73
3705520  7472 6561 6d52 3131 736d 616e 6970 5f6c 6f6e 6720 5f5f 7273 5f5f 4652 3769 7374 7265 616d 5231 3173 6d61 6e69 705f 6c6f
3705600  6e67 203b 0073 6170 706c 795f 6c6f 6e67 3a54 2830 2c36 3029 3d73 3466 6374 5f5f 3131 7361 7070 6c79 5f6c 6f6e 673a 2830
3705660  2c34 3229 2c30 2c33 323b 3b00 7361 7070 6c79 5f6c 6f6e 673a 5a63 7361 7070 6c79 5f6c 6f6e 673b 3b5f 5f63 745f 5f31 3173
3705740  6170 706c 795f 6c6f 6e67 4650 4652 3369 6f73 6c5f 5233 696f 7320 5f5f 636c 5f5f 3131 7361 7070 6c79 5f6c 6f6e 6746 6c20
3706020  3b3b 3b00 696d 616e 6970 5f6c 6f6e 673a 5428 302c 3631 293d 7338 6663 745f 5f31 3169 6d61 6e69 705f 6c6f 6e67 3a28 302c
3706100  3436 292c 302c 3332 3b61 7267 5f5f 3131 696d 616e 6970 5f6c 6f6e 673a 2830 2c31 292c 3332 2c33 323b 3b00 696d 616e 6970
```

```
3706160 5f6c 6f6e 673a 5a63 696d 616e 6970 5f6c 6f6e 673b 3b5f 5f63 745f 5f31 3169 6d61 6e69 705f 6c6f 6e67 4650 4652 3769 7374
3706240 7265 616d 6c5f 5237 6973 7472 6561 6d6c 203b 3b5f 5f72 735f 5f46 5237 6973 7472 6561 6d52 3131 696d 616e 6970 5f6c 6f6e
3706320 6720 3b00 6961 7070 6c79 5f6c 6f6e 673a 5428 302c 3632 293d 7334 6663 745f 5f31 3169 6170 706c 795f 6c6f 6e67 3a28 302c
3706400 3436 292c 302c 3332 3b3b 0069 6170 706c 795f 6c6f 6e67 3a5a 6369 6170 706c 795f 6c6f 6e67 3b3b 5f5f 6374 5f5f 3131 6961
3706460 7070 6c79 5f6c 6f6e 6746 5046 5237 6973 7472 6561 6d6c 5f52 3769 7374 7265 616d 205f 5f63 6c5f 5f31 3169 6170 706c 795f
3706540 6c6f 6e67 466c 203b 3b3b 006f 6d61 6e69 705f 6c6f 6e67 3a54 2830 2c36 3329 3d73 3866 6374 5f5f 3131 6f6d 616e 6970 5f6c
3706620 6f6e 673a 2830 2c35 3129 2c30 2c33 323b 6172 675f 5f31 316f 6d61 6e69 705f 6c6f 6e67 3a28 302c 3129 2c33 322c 3332 3b3b
3706700 006f 6d61 6e69 705f 6c6f 6e67 3a5a 636f 6d61 6e69 705f 6c6f 6e67 3b3b 5f5f 6374 5f5f 3131 6f6d 616e 6970 5f6c 6f6e 6746
3706760 5046 5237 6f73 7472 6561 6d6c 5f52 376f 7374 7265 616d 6c20 3b3b 5f5f 6c73 5f5f 4652 376f 7374 7265 616d 5231 316f 6d61
3707040 6e69 705f 6c6f 6e67 203b 006f 6170 706c 795f 6c6f 6e67 3a54 2830 2c36 3429 3d73 3466 6374 5f5f 3131 6f61 7070 6c79 5f6c
3707120 6f6e 673a 2830 2c35 3129 2c30 2c33 323b 3b00 6f61 7070 6c79 5f6c 6f6e 673a 5a63 6f61 7070 6c79 5f6c 6f6e 673b 3b5f 5f63
3707200 745f 5f31 316f 6170 706c 795f 6c6f 6e67 4650 4652 376f 7374 7265 616d 6c5f 5237 6f73 7472 6561 6d20 5f5f 636c 5f5f 3131
3707260 6f61 7070 6c79 5f6c 6f6e 6746 6c20 3b3b 3b00 696f 6d61 6e69 705f 6c6f 6e67 3a54 2830 2c36 3529 3d73 3866 6374 5f5f 3132
3707340 696f 6d61 6e69 705f 6c6f 6e67 3a28 302c 3535 292c 302c 3332 3b61 7267 5f5f 3132 696f 6d61 6e69 705f 6c6f 6e67 3a28 302c
3707420 3129 2c33 322c 3332 3b3b 0069 6f6d 616e 6970 5f6c 6f6e 673a 5a63 696f 6d61 6e69 705f 6c6f 6e67 3b3b 5f5f 6374 5f5f 3132
3707500 696f 6d61 6e69 705f 6c6f 6e67 4650 4652 3869 6f73 7472 6561 6d6c 5f52 3869 6f73 7472 6561 6d6c 203b 3b5f 5f6c 735f 5f46
3707560 5238 696f 7374 7265 616d 5231 3269 6f6d 616e 6970 5f5c 6f6e 6720 5f5f 7273 5f5f 4652 3869 6f73 7472 6561 6d52 3132 696f
3707640 6d61 6e69 705f 6c6f 6e67 203b 0069 6f61 7070 6c79 5f6c 6f6e 673a 5428 302c 3636 293d 7334 6663 745f 5f31 3269 6f61 7070
3707720 6c79 5f6c 6f6e 673a 2830 2c35 3529 2c30 2c33 323b 3b00 696f 6170 706c 795f 6c6f 6e67 3a5a 6369 6f61 7070 6c79 5f6c 6f6e
3710000 673b 3b5f 5f63 745f 5f31 3269 6f61 7070 6c79 5f6c 6f6e 6746 5046 5238 696f 7374 7265 616d 6c5f 5238 696f 7374 7265 616d
3710060 205f 5f63 6c5f 5f31 3269 6f61 7070 6c79 5f6c 6f6e 6746 6c20 3b3b 3b00 7374 6469 6f62 7566 3a54 2830 2c36 3729 3d73 3532
3710140 616c 6c6f 635f 5f39 7374 7265 616d 6275 663a 2830 2c34 292c 302c 3136 3b78 5f75 6e62 7566 5f5f 3973 7472 6561 6d62 7566
3710220 3a28 302c 3429 2c31 362c 3136 3b78 5f62 6173 655f 5f39 7374 7265 616d 6275 663a 2830 2c32 3029 2c33 322c 3332 3b78 5f70
3710300 6261 7365 5f5f 3973 7472 6561 6d62 7566 3a28 302c 3230 292c 3634 2c33 323b 785f 7070 7472 5f5f 3973 7472 6561 6d62 7566
3710360 3a28 302c 3230 292c 3936 2c33 323b 785f 6570 7074 725f 5f39 7374 7265 616d 6275 663a 2830 2c32 3029 2c31 3238 2c33 323b
3710440 785f 6770 7472 5f5f 3973 7472 6561 6d62 7566 3a28 302c 3230 292c 3136 302c 3332 3b78 5f65 6770 7472 5f5f 3973 7472 6561
3710520 6d62 7566 3a28 302c 3230 292c 3139 322c 3332 3b5c 0078 5f65 6261 636b 5f5f 3973 7472 6561 6d62 7566 3a28 302c 3230 292c
3710600 3232 342c 3332 3b78 5f62 6c65 6e5f 5f39 7374 7265 616d 6275 663a 2830 2c31 292c 3235 362c 3332 3b5f 5f76 7074 725f 5f39
3710660 7374 7265 616d 6275 663a 2830 2c33 3329 2c32 3838 2c33 323b 6670 5f5f 3873 7464 696f 6275 663a 2830 2c36 3829 3d2a 2830
3710740 2c31 3829 3d78 735f 696f 6275 663a 2c33 3230 2c33 323b 6c61 7374 5f6f 705f 5f38 7374 6469 6f62 7566 3a28 302c 3129 2c33
3711020 3532 2c33 323b 6275 665f 5f38 7374 6469 6f62 7566 3a28 302c 3639 293d 6172 2830 2c31 293b 303b 313b 2830 2c32 292c 3338
3711100 342c 3136 3b3b 0073 7464 696f 6275 663a 5a63 7374 6469 6f62 7566 3b73 7472 6561 6d62 7566 3b6f 7665 7266 6c6f 775f 5f38
3711160 7374 6469 6f62 7566 4669 2075 6e64 6572 666c 6f77 5f5f 3873 7464 696f 6275 6646 7620 7379 6e63 5f5f 3873 7464 696f 6275
3711240 6646 7620 7365 656b 6f66 665f 5f38 7374 6469 6f62 7566 466c 3873 6565 6b5f 6469 7269 2070 6261 636b 6661 696c 5f5f 3873
3711320 7464 696f 6275 6646 6920 5f5f 6374 5f5f 7373 7464 696f 6275 6646 5036 5f69 6f62 7566 205f 5f63 745f 5f38 7374 6469 6f62
3711400 7566 4652 4338 7374 6469 6f62 7566 205c 0073 7464 696f 6669 6c65 5f5f 3873 7464 696f 6275 6646 7620 5f5f 6474 5f5f 3873
3711460 7464 696f 6275 6646 7620 3b3b 3b00 6669 6c65 6275 663a 5428 302c 3730 293d 7336 3461 6c6c 6f63 5f5f 3973 7472 6561 6d62
3711540 7566 3a28 302c 3429 2c30 2c31 363b 785f 756e 6275 665f 5f39 7374 7265 616d 6275 663a 2830 2c34 292c 3136 2c31 363b 785f
3711620 6261 7365 5f5f 3973 7472 6561 6d62 7566 3a28 302c 3230 292c 3332 2c33 323b 785f 7062 6173 655f 5f39 7374 7265 616d 6275
3711700 663a 2030 2c32 3029 2c36 342c 3332 3b78 5f70 7074 725f 5f39 7374 7265 616d 6275 663a 2830 2c32 3029 2c39 362c 3332 3b78
3711760 5f65 7070 7472 5f5f 3973 7472 6561 6d62 7566 3a28 302c 3230 292c 3132 382c 3332 3b78 5f67 7074 725f 5f39 7374 7265 616d
3712040 6275 663a 2830 2c32 3029 2c31 3630 2c33 323b 785f 6567 7074 725f 5f39 7374 7265 616d 6275 663a 2830 2c32 3029 2c31 3932
3712120 2c33 323b 5c00 785f 6562 6163 6b5f 5f39 7374 7265 616d 6275 663a 2830 2c32 3029 2c32 3234 2c33 323b 785f 626c 656e 5f5f
3712200 3973 7472 6561 6d62 7566 3a28 302c 3129 2c32 3536 2c33 323b 5f5f 7670 7472 5f5f 3973 7472 6561 6d62 7566 3a28 302c 3333
3712260 292c 3238 382c 3332 3b78 6664 5f5f 3766 696c 6562 7566 3a28 302c 3129 2c33 3230 2c33 323b 6d6f 6465 5f5f 3766 696c 6562
3712340 7566 3a28 302c 3129 2c33 3532 2c33 323b 6f70 656e 6564 5f5f 3766 696c 6562 7566 3a28 302c 3229 2c33 3834 2c38 3b6c 6173
3712420 745f 7365 656b 5f5f 3766 696c 6562 7566 3a28 302c 3129 2c34 3136 2c33 323b 696e 5f73 7461 7274 5f5f 3766 696c 6562 7566
3712500 3a28 302c 3230 292c 3434 382c 3332 3b6c 6169 6561 645f 5f37 6669 6c65 6275 663a 2830 2c36 3929 2c34 3830 2c31 363b 3b00
3712560 6f70 656e 7072 6f74 5f5f 3766 696c 6562 7566 3a47 2830 2c31 2900 6669 6c65 6275 663a 5a63 6669 6c65 6275 663b 7374 7265
3712640 616d 6275 663b 5f5f 6374 5f5f 3766 696c 6562 7566 4676 205f 5f63 745f 5f37 6669 6c65 6275 6646 6920 5f5f 6374 5f5f 3766
3712720 696c 6562 7566 4669 5f63 5431 205f 5f63 745f 5f37 6669 6c65 6275 6646 5243 3766 696c 6562 7566 2069 735f 6f70 656e 5f5f
3713000 3766 696c 6562 7566 4676 2066 645f 5f37 6669 6c65 6275 6646 7620 6f70 656e 5f5f 3766 696c 6562 7566 4650 4363 6954 3220
3713060 6174 7461 6368 5f5f 3766 696c 6562 7566 4669 2063 6c6f 7365 5f5f 3766 696c 6562 7566 4676 205c 005f 5f64 745f 5f37 6669
3713140 6c65 6275 6646 7620 6f76 6572 666c 6f77 5f5f 3766 696c 6562 7566 4669 2075 6e64 6572 666c 6f77 5f5f 3766 696c 6562 7566
3713220 4676 2073 796e 635f 5f37 6669 6c65 6275 6646 7620 7365 656b 6f66 665f 5f37 6669 6c65 6275 6646 6c38 7365 656b 5f64 6972
```

```
3713300 6920 7365 7462 7566 5f5f 3766 696c 6562 7566 4650 6369 206c 6173 745f 6f70 5f5f 3766 696c 6562 7566 4676 203b 6f70 656e
3713360 7072 6f74 5f5f 3766 696c 6562 7566 203b 3b00 6673 7472 6561 6d62 6173 653a 5428 302c 3731 293d 7331 3332 6275 665f 5f31
3713440 3166 7374 7265 616d 6261 7365 3a28 302c 3730 292c 302c 3531 323b 5f5f 7670 7472 5f5f 3131 6673 7472 6561 6d62 6173 653a
3713520 2830 2c33 3329 2c35 3132 2c33 323b 5069 6f73 3a28 302c 3335 292c 3534 342c 3332 3b4f 696f 733a 2830 2c32 3629 2c35 3736
3713600 2c34 3830 3b3b 0066 7374 7265 616d 6261 7365 3a5a 6366 7374 7265 616d 6261 7365 3b69 6f73 3b5f 5f63 745f 5f31 3166 7374
3713660 7265 616d 6261 7365 4676 205f 5f63 745f 5f31 3166 7374 7265 616d 6261 7365 4650 4363 6954 3220 5f5f 6374 5f5f 3131 6673
3713740 7472 6561 6d62 6173 6546 6920 5f5f 6374 5f5f 3131 6673 7472 6561 6d62 6173 6546 6950 6354 3120 5f5f 6374 5f5f 3131 6673
3714020 7472 6561 6d62 6173 6546 5231 3166 7374 7265 616d 6261 7365 205f 5f64 745f 5f31 3166 7374 7265 616d 6261 7365 4676 206f
3714100 7265 6e5f 5f31 3166 7374 7265 616d 6261 7365 4650 4363 6954 3220 5c00 6174 7461 6368 5f5f 3131 6673 7472 6561 6d62 6173
3714160 6546 6920 636c 6f73 655f 5f31 3166 7374 7265 616d 6261 7365 4676 2073 6574 6275 665f 5f31 3166 7374 7265 616d 6261 7365
3714240 4650 6369 2072 6462 7566 5f5f 3131 6673 7472 6561 6462 6173 6546 7620 7665 7269 6679 5f5f 3131 6673 7472 6561 6d62 6173
3714320 6546 6920 3b3b 3b00 7374 6174 655f 7661 6c75 653a 7428 302c 3231 2900 5661 6c75 655f 5479 7065 3a54 2830 2c37 3229 3d65
3714400 554e 4b4e 4f57 4e56 3a30 2c53 5452 494e 473a 312c 494e 5445 4745 523a 322c 464c 4f41 543a 332c 3b00 426c 6f63 6b5f 5479
3714460 7065 3a54 2830 2c37 3329 3d65 554e 4b4e 4f57 4e42 3a30 2c45 4e54 4954 593a 312c 4655 4e43 5449 4f4e 3a32 2c50 524f 4345
3714540 4455 5245 3a33 2c3b 0045 6e74 6974 795f 5479 7065 3a54 2830 2c37 3429 3d65 554e 4b4e 4f57 4e45 3a30 2c41 5243 4849 5445
3714620 4354 5552 453a 312c 5355 4250 524f 4752 414d 3a32 2c3b 0050 696e 5f54 7970 653a 5428 302c 3735 293d 6555 4e4b 4e4f 574e
3714700 503a 302c 494e 5049 4e3a 312c 4f55 5450 494e 3a32 2c49 4e4f 5554 5049 4e3a 332c 3b00 5061 7261 5f43 6c61 7373 3a54 2830
3714760 2c37 3629 3d65 554e 4b4e 4f57 4e43 3a30 2c46 4f52 4d41 4c3a 312c 4143 5455 414c 3a32 2c52 4553 4f4c 5645 443a 332c 3b00
3715040 424f 4f4c 4541 4e3a 5428 302c 3737 293d 6546 616c 7365 3a30 2c54 7275 653a 312c 3b00 426f 6f6c 6561 6e3a 5428 302c 3738
3715120 293d 6566 616c 7365 3a30 2c74 7275 653a 312c 3b00 4275 6666 6572 3a47 2830 2c32 3029 004f 626a 6563 743a 5428 302c 3739
3715200 293d 7334 5f5f 7670 7472 5f5f 364f 626a 6563 743a 2830 2c33 3329 2c30 2c33 323b 3b00 4f62 6a65 6374 3a5a 634f 626a 6563
3715260 743b 3b5f 5f63 745f 5f36 4f62 6a65 6374 4676 205f 5f63 745f 5f36 4f62 6a65 6374 4652 4336 4f62 6a65 6374 2065 7272 6f72
3715340 4d65 6d6f 7279 5f5f 364f 626a 6563 743a 2830 2c32 3029 2c33 3332 3b3b 004e 4f62 6a65 6374 3a5a 634e 4f62 6a65 6374 3b4f 626a
3715420 5f5f 364f 626a 6563 7446 5036 4f62 6a65 6374 203b 3b3b 005f 5f70 7462 6c5f 5f36 4f62 6a65 6374 5f5f 4465 636f 6465 725f
3715500 6378 783a 4728 302c 3333 2900 5046 3a74 2830 2c31 3529 0050 4643 3a74 2830 2c31 3529 0050 4649 3a74 2830 2c31 3529 004e
3715560 4f62 6a65 6374 3a54 2830 2c38 3029 3d73 385f 5f76 7074 725f 5f36 4f62 6a65 6374 3a28 302c 3333 292c 302c 3332 3b6e 616d
3715640 655f 5f37 4e4f 626a 6563 743a 2830 2c32 3029 2c33 322c 3332 3b3b 004e 4f62 6a65 6374 3a5a 634e 4f62 6a65 6374 3b4f 626a
3715720 6563 743b 5f5f 6374 5f5f 374e 4f62 6a65 6374 4650 6320 5f5f 6374 5f5f 374e 4f62 6a65 6374 4652 4337 4e4f 626a 6563 7420
3716000 7365 744e 616d 655f 5f37 4e4f 626a 6563 7446 5063 2067 6574 4e61 6d65 5f5f 374e 4f62 6a65 6374 4676 2065 7870 6c61 696e
3716060 5f5f 374e 4f62 6a65 6374 4650 6320 6765 7441 7474 725f 5f37 4e4f 626a 6563 7446 6920 6765 7450 726f 705f 5f37 4e4f 626a
3716140 6563 7446 5063 6920 7365 7450 726f 705f 5f37 4e4f 626a 6563 7446 5063 5431 205c 0073 6574 5072 6f70 5f5f 374e 4f62 6a65
3716220 6374 4650 6369 2073 6574 5072 6f70 5f5f 374e 4f62 6a65 6374 4650 6366 2069 7347 5445 5f5f 374e 4f62 6a65 6374 4650 364f
3716300 626a 6563 7420 6973 4c54 455f 5f37 4e4f 626a 6563 7446 5036 4f62 6a65 6374 203b 3b3b 006f 7374 7265 616d 5f77 6974 6861
3716360 7373 6967 6e3a 5428 302c 3339 293d 7336 385f 5f76 7074 725f 5f37 6f73 7472 6561 6d3a 2830 2c33 3329 2c30 2c33 323b 5069
3716440 6f73 3a28 302c 3335 292c 3332 2c33 323b 4f69 6f73 3a28 302c 3236 292c 3634 2c34 3830 3b3b 006f 7374 7265 616d 5f77 6974
3716520 6861 7373 6967 6e3a 5a63 6f73 7472 6561 6d5f 7769 7468 6173 7369 676e 3b6f 7374 7265 616d 2069 6f73 3b5f 5f63 745f 5f31
3716600 386f 7374 7265 616d 5f77 6974 6861 7373 6967 6e46 7620 5f5f 6374 5f5f 3138 6f73 7472 6561 6d5f 7769 7468 6173 7369 676e
3716660 4652 3138 6f73 7472 6561 6d5f 7769 7468 6173 7369 676e 205f 5f64 745f 5f31 386f 7374 7265 616d 5f77 6974 6861 7373 6967
3716740 6e46 7620 5f5f 6173 5f5f 3138 6f73 7472 6561 6d5f 7769 7468 6173 7369 676e 4652 376f 7374 7265 616d 205c 005f 5f61 735f
3717020 5f31 386f 7374 7265 616d 5f77 6974 6861 7373 6967 6e46 5039 7374 7265 616d 6275 6620 3b3b 3b00 5046 423a 7428 302c 3135
3717100 2900 4c4e 4f62 6a65 6374 3a54 2830 2c38 3129 3d73 3132 5f5f 7670 7472 5f5f 364f 626a 6563 743a 2830 2c33 3329 2c30 2c33
3717160 323b 6e61 6d65 5f5f 374e 4f62 6a65 6374 3a28 302c 3230 292c 3332 2c33 323b 6e65 7874 5f5f 384c 4e4f 626a 6563 743a 2830
3717240 2c38 3229 3d2a 2830 2c38 3129 2c36 342c 3332 3b3b 004c 4e4f 626a 6563 743a 5a63 4c4e 4f62 6a65 6374 3b4e 4f62 6a65 6374
3717320 3b5f 5f63 745f 5f38 4c4e 4f62 6a65 6374 4650 6350 384c 4e4f 626a 6563 7420 5f5f 6374 5f5f 384c 4e4f 626a 6563 7446 5243
3717400 384c 4e4f 626a 6563 7420 7365 744e 6578 745f 5f38 4c4e 4f62 6a65 6374 4650 384c 4e4f 626a 6563 7420 6765 744e 6578 745f
3717460 5f38 4c4e 4f62 6a65 6374 4676 203b 3b3b 004c 4f62 6a65 6374 3a54 2830 2c38 3329 3d73 385f 5f76 7074 725f 5f36 4f62 6a65
3717540 6374 3a28 302c 3333 292c 302c 3332 3b6e 6578 745f 5f37 4c4f 626a 6563 743a 2830 2c38 3429 3d2a 2830 2c38 3329 2c33 322c
3717620 3332 3b3b 004c 4f62 6a65 6374 3a5a 634c 4f62 6a65 6374 3b4f 626a 6563 743b 5f5f 6374 5f5f 374c 4f62 6a65 6374 4650 374c
3717700 4f62 6a65 6374 205f 5f63 745f 5f37 4c4f 626a 6563 7446 5243 374c 4f62 6a65 6374 2073 6574 4e65 7874 5f5f 374c 4f62 6a65
3717760 6374 4650 374c 4f62 6a65 6374 2067 6574 4e65 7874 5f5f 374c 4f62 6a65 6374 4676 203b 3b3b 004c 504f 626a 6563 743a 5428
3720040 302c 3935 293d 7331 325f 5f76 7074 725f 5f36 4f62 6a65 6374 3a28 302c 3333 292c 302c 3332 3b6e 6578 745f 5f37 4c4f 626a
3720120 6563 743a 2830 2c38 3429 2c33 322c 3332 3b6e 6f62 6a70 7472 5f5f 384c 504f 626a 6563 743a 2830 2c39 3629 3d2a 2830 2c38
3720200 3029 2c36 342c 3332 3b3b 004c 504f 626a 6563 743a 5a63 4c50 4f62 6a65 6374 3b4c 4f62 6a65 6374 3b5f 5f63 745f 5f38 4c50
3720260 4f62 6a65 6374 4650 374e 4f62 6a65 6374 5037 4c4f 626a 6563 7420 5f5f 6374 5f5f 384c 504f 626a 6563 7446 5243 384c 504f
3720340 626a 6563 7420 7365 744f 626a 6563 745f 5f38 4c50 4f62 6a65 6374 4650 374e 4f62 6a65 6374 2067 6574 4f62 6a65 6374 5f5f
```

```
3720420 384c 504f 626a 6563 7446 7620 6578 706c 6169 6e5f 5f38 4c50 4f62 6a65 6374 4650 6320 3b3b 3b00 5f5f 7074 626c 5f5f 384c
3720500 504f 626a 6563 745f 5f44 6563 6f64 6572 5f63 7878 3a47 2830 2c33 3329 004c 6973 743a 5428 302c 3937 293d 7331 3263 6f75
3720560 6e74 5f5f 344c 6973 743a 2830 2c31 292c 302c 3332 3b70 7472 4c4f 626a 6563 745f 5f34 4c69 7374 3a28 302c 3834 292c 3332
3720640 2c33 323b 5f5f 7670 7472 5f5f 344c 6973 743a 2830 2c33 3329 2c36 342c 3332 3b3b 004c 6973 743a 5a63 4c69 7374 3b3b 5f5f
3720720 6374 5f5f 344c 6973 7446 7620 5f5f 6374 5f5f 344c 6973 7446 5243 344c 6973 7420 5f5f 6474 5f5f 344c 6973 7446 7620 6765
3721000 7443 6f75 6e74 5f5f 344c 6973 7446 7620 6765 7454 6f70 5f5f 344c 6973 7446 7620 7365 7454 6f70 5f5f 344c 6973 7446 5037
3721060 4c4f 626a 6563 7420 6572 726f 724d 656d 6f72 795f 5f34 4c69 7374 4650 6354 3120 6272 6f61 6463 6173 745f 5f34 4c69 7374
3721140 464d 364f 626a 6563 7446 765f 7620 6578 706c 6169 6e5f 5f34 4c69 7374 4650 6320 5c00 696e 7365 7274 5f5f 344c 6973 7446
3721220 5037 4c4f 626a 6563 7420 6973 4d65 6d62 6572 5f5f 344c 6973 7446 5037 4c4f 626a 6563 7420 6973 4d65 6d62 6572 5f5f 344c
3721300 6973 7446 5063 2069 7345 7175 616c 5f5f 344c 6973 7446 5234 4c69 7374 2072 656d 6f76 655f 5f34 4c69 7374 4650 6320 3b3b
3721360 3b00 5f5f 7074 626c 5f5f 344c 6973 745f 5f44 6563 6f64 6572 5f63 7878 3a47 2830 2c33 3329 0050 4c69 7374 3a54 2830 2c38
3721440 3829 3d73 3132 636f 756e 745f 5f34 4c69 7374 3a28 302c 3129 2c30 2c33 323b 7074 724c 4f62 6a65 6374 5f5f 344c 6973 743a
3721520 2830 2c38 3429 2c33 322c 3332 3b5f 5f76 7074 725f 5f34 4c69 7374 3a28 302c 3333 292c 3634 2c33 323b 3b00 504c 6973 743a
3721600 5a63 504c 6973 743b 4c69 7374 3b69 6e73 6572 745f 5f35 504c 6973 7446 5038 4c50 4f62 6a65 6374 2069 6e73 6572 745f 5f35
3721660 504c 6973 7446 5235 504c 6973 7420 536f 7274 5f50 4c69 7374 5f5f 3550 4c69 7374 4669 2072 6576 6572 7365 5f5f 3550 4c69
3721740 7374 4676 2069 6e73 6572 7441 6674 6572 5f5f 3550 4c69 7374 4650 384c 504f 626a 6563 7454 3120 7265 6d6f 7665 5f5f 3550
3722020 4c69 7374 4650 384c 504f 626a 6563 7420 7265 6d6f 7665 5f5f 3550 4c69 7374 4650 6320 6973 4d65 6d62 6572 5f5f 3550 4c69
3722100 7374 4650 6320 5c00 6973 4d65 6d62 6572 5f5f 3550 4c69 7374 4650 374c 4f62 6a65 6374 2069 7345 7175 616c 5f5f 3550 4c69
3722160 7374 4652 344c 6973 7420 6578 706c 6169 6e5f 5f35 504c 6973 7446 5063 205f 5f63 745f 5f35 504c 6973 7446 5243 3550 4c69
3722240 7374 205f 5f63 745f 5f35 504c 6973 7446 7620 3b3b 3b00 5f5f 7074 626c 5f5f 3550 4c69 7374 5f5f 4465 636f 6465 725f 6378
3722320 783a 4728 302c 3333 2900 4c69 7374 4974 6572 6174 6f72 3a54 2830 2c38 3929 3d73 386c 6973 745f 5f31 324c 6973 7449 7465
3722400 7261 746f 723a 2830 2c39 3029 3d2a 2830 2c38 3729 2c30 2c33 323b 705f 5f31 324c 6973 7449 7465 7261 746f 723a 2830 2c38
3722460 3429 2c33 322c 3332 3b3b 004c 6973 7449 7465 7261 746f 723a 5a63 4c69 7374 4974 6572 6174 6f72 3b3b 5f5f 6374 5f5f 3132
3722540 4c69 7374 4974 6572 6174 6f72 4652 344c 6973 7420 7265 7365 745f 5f31 324c 6973 7449 7465 7261 746f 7246 7620 6174 7461
3722620 6368 5f5f 3132 4c69 7374 4974 6572 6174 6f72 4652 344c 6973 7420 6765 7443 7572 7265 6e74 5f5f 3132 4c69 7374 4974 6572
3722700 6174 6f72 4676 205f 5f70 705f 5f31 324c 6973 7449 7465 7261 746f 7246 7620 3b3b 3b00 5069 6e4c 656e 6774 683a 5428 302c
3722760 3931 293d 7331 365f 5f76 7074 725f 5f36 4f62 6a65 6374 3a28 302c 3333 292c 302c 3332 3b6e 616d 655f 5f37 4e4f 626a 6563
3723040 743a 2830 2c32 3029 2c33 322c 3332 3b43 6c65 6e67 7468 5f5f 3950 696e 4c65 6e67 7468 3a28 302c 3230 292c 3634 2c33 323b
3723120 496c 656e 6774 685f 5f39 5069 6e4c 656e 6774 683a 2830 2c31 292c 3936 2c33 323b 3b00 5069 6e4c 656e 6774 683a 5a63 5069
3723200 6e4c 656e 6774 683b 4e4f 626a 6563 743b 5f5f 6374 5f5f 3950 696e 4c65 6e67 7468 4650 6354 3120 5f5f 6374 5f5f 3950 696e
3723260 4c65 6e67 7468 4652 4339 5069 6e4c 656e 6774 6820 7365 745f 5069 6e4c 656e 6774 685f 5f39 5069 6e4c 656e 6774 6846 5063
3723340 5431 2067 6574 5f49 5f50 696e 4c65 6e67 7468 5f5f 3950 696e 4c65 6e67 7468 4676 2067 6574 5f49 5f50 696e 4c65 6e67 7468
3723420 5f5f 3950 696e 4c65 6e67 7468 4669 203b 3b3b 004d 6f64 4765 6e3a 5428 302c 3932 293d 7332 3442 6974 5769 6474 685f 5f36
3723500 4d6f 6447 656e 3a28 302c 3129 2c30 2c33 323b 4553 7461 7465 5f5f 364d 6f64 4765 6e3a 2830 2c37 3829 2c33 322c 3332 3b50
3723560 696e 4e61 6d65 4c65 6e67 7468 5f5f 364d 6f64 4765 6e3a 2830 2c38 3829 2c36 342c 3936 3b5f 5f76 7074 725f 5f36 4d6f 6447
3723640 656e 3a28 302c 3333 292c 3136 302c 3332 3b3b 004d 6f64 4765 6e3a 5a63 4d6f 6447 656e 3b3b 5f5f 6374 5f5f 364d 6f64 4765
3723720 6e46 7620 5f5f 6374 5f5f 364d 6f64 4765 6e46 5243 364d 6f64 4765 6e20 7365 745f 4269 7457 6964 7468 5f5f 364d 6f64 4765
3724000 6e46 6920 7365 745f 4553 7461 7465 5f5f 364d 6f64 4765 6e46 3742 6f6f 6c65 616e 2067 6574 5f45 5374 6174 655f 5f36 4d6f
3724060 6447 656e 4676 2073 6574 5f50 696e 4c65 6e67 7468 5f5f 364d 6f64 4765 6e46 5063 5431 2067 6574 5f50 696e 4c65 6e67 7468
3724140 5f5f 364d 6f64 4765 6e46 5063 2073 6574 496e 6465 785f 5f36 4d6f 6447 656e 4676 205c 0073 6574 4e61 6d65 496e 6465 785f
3724220 5f36 4d6f 6447 656e 4650 6320 4c6f 6164 5f56 4844 4c5f 4461 7461 5f5f 364d 6f64 4765 6e46 5037 4e4f 626a 6563 7420 436f
3724300 6d70 6f73 655f 436f 6447 656e 5f44 6573 6372 6970 746f 725f 5f36 4d6f 6447 656e 4650 6320 6578 706c 6169 6e5f 5f36 4d6f
3724360 6447 656e 4676 205f 5f64 745f 5f36 436f 6447 656e 4676 203b 3b3b 005f 5f70 7462 6c5f 5f36 436f 6447 656e 5f5f 4465 636f
3724440 6465 725f 6378 783a 4728 302c 3333 2900 494f 5f4d 616e 6167 6572 3a54 2830 2c39 3329 3d73 3336 6966 705f 5f31 3049 4f5f
3724520 4d61 6e61 6765 723a 2830 2c36 3829 2c30 2c33 323b 6f66 705f 5f31 3049 4f5f 4d61 6e61 6765 723a 2830 2c36 3829 2c33 322c
3724600 3332 3b6d 6670 5f5f 3130 494f 5f4d 616e 6167 6572 3a28 302c 3638 292c 3634 2c33 323b 6366 705f 5f31 3049 4f5f 4d61 6e61
3724660 6765 723a 2830 2c36 3829 2c39 362c 3332 3b49 4669 6c65 4e61 6d65 5f5f 3130 494f 5f4d 616e 6167 6572 3a28 302c 3230 292c
3724740 3132 382c 3332 3b4f 4669 6c65 4e61 6d65 5f5f 3130 494f 5f4d 616e 6167 6572 3a28 302c 3230 292c 3136 302c 3332 3b4d 4669
3725020 6c65 4e61 6d65 5f5f 3130 494f 5f4d 616e 6167 6572 3a28 302c 3230 292c 3139 322c 3332 3b43 4669 6c65 4e61 6d65 5f5f 3130
3725100 494f 5f4d 616e 6167 6572 3a28 302c 3230 292c 3232 342c 3332 3b63 754c 696e 655f 5f31 3049 4f5f 4d61 6e61 6765 723a 2830
3725160 2c31 292c 3235 362c 3332 3b3b 0049 4f5f 4d61 6e61 6765 723a 5a63 494f 5f4d 616e 6167 6572 3b3b 5f5f 6374 5f5f 3130 494f
3725240 5f4d 616e 6167 6572 4650 6320 5f5f 6474 5f5f 3130 494f 5f4d 616e 6167 6572 4676 2049 4f43 6865 636b 5f5f 3130 494f 5f4d
3725320 616e 6167 6572 4676 2043 6f70 7946 696c 6554 6f4c 696e 655f 5f31 3049 4f5f 4d61 6e61 6765 7246 6920 436f 7079 4669 6c65
3725400 546f 456e 645f 5f31 3049 4f5f 4d61 6e61 6765 7246 7620 5374 6174 6d65 6e74 4861 6e64 656c 6572 5f5f 3130 494f 5f4d 616e
3725460 6167 6572 4650 6354 3169 205c 0043 6f70 7946 696c 6554 6f4b 6579 575f 5f31 3049 4f5f 4d61 6e61 6765 7246 5063 5431 2045
```

```
3725540  6174 5f53 7461 7465 6d65 6e74 5f5f 3130 494f 5f4d 616e 6167 6572 4650 6354 3120 575f 4f75 7446 696c 655f 5f31 3049 4e5f
3725620  4d61 6e61 6765 7246 5063 2057 5f4d 4669 6c65 5f5f 3130 494f 5f4d 616e 6167 6572 4650 6320 575f 4346 696c 655f 5f31 3049
3725700  4f5f 4d61 6e61 6765 7246 5063 203b 3b3b 005f 5f43 3535 3a54 2830 2c39 3429 3d75 3473 7661 6c75 653a 2830 2c32 3029 2c30
3725760  2c33 323b 6976 616c 7565 3a28 302c 3129 2c30 2c33 323b 6676 616c 7565 3a28 302c 3929 2c30 2c33 323b 3b00 5f5f 4335 353a
3726040  5a63 5f5f 4335 353b 3b3b 3b3b 0047 656e 5661 6c75 653a 5428 302c 3935 293d 7331 365f 5f76 7074 725f 5f36 4f62 6a65 6374
3726120  3a28 302c 3333 292c 302c 3332 3b6e 616d 655f 5f37 4e4f 626a 6563 743a 2830 2c32 3029 2c33 322c 3332 3b74 7970 655f 5f38
3726200  4765 6e56 616c 7565 3a28 302c 3732 292c 3634 2c33 323b 5f5f 4f35 355f 5f38 4765 6e56 616c 7565 3a28 302c 3934 292c 3936
3726260  2c33 323b 3b00 4765 6e56 616c 7565 3a5a 6347 656e 5661 6c75 653b 4e4f 626a 6563 743b 5f5f 6374 5f5f 3847 656e 5661 6c75
3726340  6546 7620 5f5f 6374 5f5f 3847 656e 5661 6c75 6546 5243 3847 656e 5661 6c75 6520 5f5f 6474 5f5f 3847 656e 5661 6c75 6546
3726420  7620 7365 745f 4765 6e56 616c 7565 5f74 7970 655f 5f38 4765 6e56 616c 7565 4650 6369 2073 6574 5f47 656e 5661 6c75 655f
3726500  7479 7065 5f5f 3847 656e 5661 6c75 6546 3130 5661 6c75 655f 5479 7065 2073 6574 5f47 656e 5661 6c75 655f 5f38 4765 6e56
3726560  616c 7565 4650 6320 5c00 7365 745f 4765 6e56 616c 7565 5f5f 3847 656e 5661 6c75 6546 6920 7365 745f 4765 6e56 616c 7565
3726640  5f5f 3847 656e 5661 6c75 6546 6620 6765 745f 4765 6e56 616c 7565 5f74 7970 655f 5f38 4765 6e56 616c 7565 4676 2067 6574
3726720  5f47 656e 5661 6c75 655f 735f 5f38 4765 6e56 616c 7565 4676 2067 6574 5f47 656e 5661 6c75 655f 695f 5f38 4765 6e56 616c
3727000  7565 4676 2067 6574 5f47 656e 5661 6c75 655f 665f 5f38 4765 6e56 616c 7565 4676 2065 7870 6c61 696e 5f5f 3847 656e 5661
3727060  6c75 6546 5063 205c 0063 6865 636b 5f5f 3847 656e 5661 6c75 6546 6920 3b3b 3b00 5f5f 7074 626c 5f5f 3847 656e 5661 6c75
3727140  655f 5f44 6563 6f64 6572 5f63 7878 3a47 2830 2c33 3329 0070 6172 616d 6574 6572 3a54 2830 2c39 3629 3d73 3630 5f5f 7670
3727220  7472 5f5f 364f 626a 6563 743a 2830 2c33 3329 2c30 2c33 323b 6e61 6d65 5f5f 374e 4f62 6a65 6374 3a28 302c 3230 292c 3332
3727300  2c33 323b 6e61 6165 5f5f 3970 6172 616d 6574 6572 3a28 302c 3230 292c 3634 2c33 323b 7479 7065 5f5f 3970 6172 616d 6574
3727360  6572 3a28 302c 3230 292c 3936 2c33 323b 7261 6e67 655f 5f39 7061 7261 6d65 7465 723a 2830 2c32 3029 2c31 3238 2c33 323b
3727440  736c 6963 655f 5f39 7061 7261 6465 7465 723a 2830 2c32 3029 2c31 3630 2c33 323b 536c 6f77 5f5f 3970 6172 616d 6574 6572
3727520  3a28 302c 3129 2c31 3932 2c33 323b 5368 6967 685f 5f39 7061 7261 6d65 7465 723a 2830 2c31 292c 3232 342c 3332 3b5c 0050
3727600  436c 6173 735f 5f39 7061 7261 6d65 7465 723a 2830 2c37 3629 2c32 3536 2c33 323b 5058 5265 665f 5f39 7061 7261 6d65 7465
3727660  723a 2830 2c39 3729 3d2a 2830 2c39 3629 2c32 3938 2c33 323b 6d6f 6465 5f5f 3970 6172 616d 6574 6572 3a28 302c 3735 292c
3727740  3332 302c 3332 3b76 616c 7565 5f5f 3970 6172 616d 6574 6572 3a28 302c 3935 292c 3335 322c 3132 383b 3b00 7061 7261 6d65
3730020  7465 723a 5a63 7061 7261 6d65 7465 723b 4e4f 626a 6563 743b 5f5f 6374 5f5f 3970 6172 616d 6574 6572 4676 205f 5f63 745f
3730100  5f39 7061 7261 6d65 7465 7246 5243 3970 6172 616d 6574 6572 205f 5f64 745f 5f39 7061 7261 6d65 7465 7246 7620 6765 745f
3730160  7061 7261 6d65 7465 725f 6d6f 6465 5f5f 3970 6172 616d 6574 6572 4676 2067 6574 5f70 6172 616d 6574 6572 5f63 6c61 7373
3730240  5f5f 3970 6172 616d 6574 6572 4676 2067 6574 5f70 6172 615f 736c 6f77 5f5f 3970 6172 616d 6574 6572 4676 205c 0067 6574
3730320  5f70 6172 615f 7368 6967 685f 5f39 7061 7261 6d65 7465 7246 7620 6765 745f 7061 7261 6d65 7465 725f 7261 6e67 655f 5f39
3730400  7061 7261 6d65 7465 7246 7620 6765 745f 7061 7261 6d65 7465 725f 7479 7065 5f5f 3970 6172 616d 6574 6572 4676 2067 6574
3730460  5f70 6172 616d 6574 6572 5f6e 616d 655f 5f39 7061 7261 6d65 7465 7246 7620 6765 745f 7061 7261 6d65 7465 725f 736c 6963
3730540  655f 5f39 7061 7261 6d65 7465 7246 7620 6765 745f 7061 7261 6d65 7465 725f 5058 5245 465f 5f39 7061 7261 6d65 7465 7246
3730620  3130 5061 7261 5f43 6c61 7373 205c 0067 6574 5f63 6f72 7265 6374 5f6c 656e 6774 685f 5f39 7061 7261 6d65 7465 7246 7620
3730700  6765 745f 7061 7261 5f6c 656e 6774 685f 5f39 7061 7261 6d65 7465 7246 7620 6765 745f 7061 7261 5f73 7461 7475 735f 5f39
3730760  7061 7261 6d65 7465 7246 7620 6765 745f 7061 7261 6d65 7465 725f 7661 6c75 655f 5f39 7061 7261 6d65 7465 7246 7620 6765
3731040  745f 7061 7261 6465 7465 725f 7661 6c75 655f 7479 7065 5f5f 3970 6172 616d 6574 6572 4676 2067 6574 5f70 6172 616d 6574
3731120  6572 5f73 7661 6c75 655f 5f39 7061 7261 6d65 7465 7246 7620 5c00 6765 745f 7061 7261 6d65 7465 725f 6976 616c 7565 5f5f
3731200  3970 6172 616d 6574 6572 4676 2067 6574 5f70 6172 616d 6574 6572 5f66 7661 6c75 655f 5f39 7061 7261 6d65 7465 7246 7620
3731260  7365 745f 7061 7261 6d65 7465 725f 6e61 6465 5f5f 3970 6172 616d 6574 6572 4650 6320 7365 745f 7061 7261 6d65 7465 725f
3731340  636c 6173 735f 5f39 7061 7261 6d65 7465 7246 3130 5061 7261 5f43 6c61 7373 2073 6574 5f70 6172 616d 6574 6572 5f74 7970
3731420  655f 5f39 7061 7261 6d65 7465 7246 5063 2073 6574 5f70 6172 616d 6574 6572 5f73 6c69 6365 5f5f 3970 6172 616d 6574 6572
3731500  4650 6320 5c00 7365 745f 7061 7261 6d65 7465 725f 7372 616e 6765 5f5f 3970 6172 616d 6574 6572 4650 6320 7365 745f 7061
3731560  7261 6d65 7465 725f 5058 5265 665f 5f39 7061 7261 6d65 7465 7246 5063 5035 626c 6f63 6b20 7365 745f 7061 7261 6d65 7465
3731640  725f 7261 6e67 655f 5f39 7061 7261 6d65 7465 7246 5063 2073 6574 5f70 6172 616d 6574 6572 5f6d 6f64 655f 5f39 7061 7261
3731720  6d65 7465 7246 5063 2073 6574 5f70 6172 616d 6574 6572 5f76 616c 7565 5f5f 3970 6172 616d 6574 6572 4650 6320 7365 745f
3732000  7061 7261 6d65 7465 725f 7661 6c75 655f 5f39 7061 7261 6d65 7465 7246 6920 5c00 7365 745f 7061 7261 6d65 7465 725f 7661
3732060  6c75 655f 5f39 7061 7261 6d65 7465 7246 6620 7365 745f 7061 7261 6d65 7465 725f 7661 6c75 655f 7479 7065 5f5f 3970 6172
3732140  616d 6574 6572 4650 6320 6765 745f 5648 444c 5f46 6f72 6d61 6c5f 5061 7261 6d5f 5f39 7061 7261 6d65 7465 7246 5063 6920
3732220  6765 745f 5648 444c 5f50 726d 7472 5f5f 3970 6172 616d 6574 6572 4650 6369 2067 6574 5f56 4844 4c5f 4578 7061 6e64 6564
3732300  5f46 6f72 6d61 6c5f 5061 7261 615f 5f39 7061 7261 6d65 7465 7246 5035 626c 6f63 6b50 6369 205c 0067 6574 5f56 4844 4c5f
3732360  4578 7061 6e64 6564 5f50 726d 7472 5f4d 6170 5f5f 3970 6172 616d 6574 6572 4650 3562 6c6f 636b 5063 6920 6578 706c 6169
3732440  6e5f 5f39 7061 7261 6d65 7465 7246 5063 203b 3b3b 005f 5f70 7462 6c5f 5f39 7061 7261 6d65 7465 725f 5f44 6563 6f64 6572
3732520  5f63 7878 3a47 2830 2c33 3329 0062 6c6f 636b 5f61 7474 7269 6275 7465 733a 5428 302c 3938 293d 7332 385f 5f76 7074 725f
3732600  5f36 4f62 6a65 6374 3a28 302c 3333 292c 302c 3332 3b6e 616d 655f 5f37 4e4f 626a 6563 743a 2830 2c32 3029 2c33 322c 3332
```

```
3732660  306e 616d 655f 5f31 3662 6c6f 636b 5f61 7474 7269 6275 7465 733a 2830 2c32 3029 2c36 342c 3332 3b76 616c 7565 5f5f 3136
3732740  626c 6f63 6b5f 6174 7472 6962 7574 6573 3a28 302c 3935 292c 3936 2c31 3238 3b3b 0062 6c6f 636b 5f61 7474 7269 6275 7465
3733020  733a 5a63 626c 6f63 6b5f 6174 7472 6962 7574 6573 3b4e 4f62 6a65 6374 3b5f 5f63 745f 5f31 3662 6c6f 636b 5f61 7474 7269
3733100  6275 7465 7346 5063 205f 5f63 745f 5f31 3662 6c6f 636b 5f61 7474 7269 6275 7465 7346 7620 5f5f 6374 5f5f 3136 626c 6f63
3733160  6b5f 6174 7472 6962 7574 6573 4652 4331 3662 6c6f 636b 5f61 7474 7269 6275 7465 7320 5f5f 6474 5f5f 3136 626c 6f63 6b5f
3733240  6174 7472 6962 7574 6573 4676 2073 6574 5f61 7474 7269 6275 7465 5f6e 616d 655f 5f31 3662 6c6f 636b 5f61 7474 7269 6275
3733320  7465 7346 5063 205c 0073 6574 5f61 7474 7269 6275 7465 5f76 616c 7565 5f5f 3136 626c 6f63 6b5f 6174 7472 6962 7574 6573
3733400  4650 6320 7365 745f 6174 7472 6962 7574 655f 7661 6c75 655f 5f31 3662 6c6f 636b 5f61 7474 7269 6275 7465 7346 6920 7365
3733460  745f 6174 7472 6962 7574 655f 7661 6c75 655f 5f31 3662 6c6f 636b 5f61 7474 7269 6275 7465 7346 6620 7365 745f 6174 7472
3733540  6962 7574 655f 7479 7065 5f5f 3136 626c 6f63 6b5f 6174 7472 6962 7574 6573 4650 6320 6765 745f 6174 7472 6962 7574 655f
3733620  6e61 6d65 5f5f 3136 626c 6f63 6b5f 6174 7472 6962 7574 6573 4676 205c 0067 6574 5f61 7474 7269 6275 7465 5f74 7970 655f
3733700  5f31 3662 6c6f 636b 5f61 7474 7269 6275 7465 7346 7620 6765 745f 6174 7472 6962 7574 655f 7376 616c 7565 5f5f 3136 626c
3733760  6f63 6b5f 6174 7472 6962 7574 6573 4676 2067 6574 5f61 7474 7269 6275 7465 5f69 7661 6c75 655f 5f31 3662 6c6f 636b 5f61
3734040  7474 7269 6275 7465 7346 7620 6765 745f 6174 7472 6962 7574 655f 6676 616c 7565 5f5f 3136 626c 6f63 6b5f 6174 7472 6962
3734120  7574 6573 4676 2067 6574 5f61 7474 7269 6275 7465 5f76 616c 7565 5f5f 3136 626c 6f63 6b5f 6174 7472 6962 7574 6573 4676
3734200  205c 0065 7870 6c61 696e 5f5f 3136 626c 6f63 6b5f 6174 7472 6962 7574 6573 4650 6320 3b3b 3b00 5f5f 7074 626c 5f5f 3136
3734260  626c 6f63 6b5f 6174 7472 6962 7574 6573 5f5f 4465 636f 6465 725f 6378 783a 4728 302c 3333 2900 656e 7469 7479 3a54 2830
3734340  2c39 3929 3d73 3630 5f5f 7670 7472 5f5f 364f 626a 6563 743a 2830 2c33 3329 2c30 2c33 323b 6e61 6d65 5f5f 374e 4f62 6a65
3734420  6374 3a28 302c 3230 292c 3332 2c33 323b 6e61 6d65 5f5f 3665 6e74 6974 793a 2830 2c32 3029 2c36 342c 3332 3b46 696c 654e
3734500  616d 655f 5f36 656e 7469 7479 3a28 302c 3230 292c 3936 2c33 323b 6172 6368 6e61 6d65 5f5f 3665 6e74 6974 793a 2830 2c32
3734560  3029 2c31 3238 2c33 323b 7479 7065 5f5f 3665 6e74 6974 793a 2830 2c31 292c 3136 302c 3332 3b61 7263 685f 6c69 6e65 5f5f
3734640  3665 6e74 6974 793a 2830 2c31 292c 3139 322c 3332 3b63 616c 6c5f 6c69 6e65 5f5f 3665 6e74 6974 793a 2830 2c31 292c 3232
3734720  342c 3332 3b5c 0070 7263 735f 6c69 6e65 5f5f 3665 6e74 6974 793a 2830 2c31 292c 3235 362c 3332 3b71 7561 6c69 6669 6564
3735000  5f5f 3665 6e74 6974 793a 2830 2c38 3829 2c32 3838 2c39 363b 7375 625f 626c 6f63 6b73 5f5f 3665 6e74 6974 793a 2830 2c38
3735060  3829 2c33 3834 2c39 363b 3b00 656e 7469 7479 3a5a 6365 6e74 6974 793b 4e4f 626a 6563 743b 5f5f 6374 5f5f 3665 6e74 6974
3735140  7946 7620 5f5f 6374 5f5f 3665 6e74 6974 7946 5243 3665 6e74 6974 7920 5f5f 6474 5f5f 3665 6e74 6974 7946 7620 7365 745f
3735220  656e 7469 7479 5f6e 616d 655f 5f36 656e 7469 7479 4650 6320 7365 745f 656e 7469 7479 5f66 696c 655f 5f36 656e 7469 7479
3735300  4650 6320 7365 745f 656e 7469 7479 5f61 7263 696e 616d 655f 5f36 656e 7469 7479 4650 6320 7365 745f 656e 7469 7479 5f74
3735360  7970 655f 5f36 656e 7469 7479 4650 6320 5c00 7365 745f 6172 6368 5f6c 696e 655f 5f36 656e 7469 7479 4669 2073 6574 5f63
3735440  616c 6c5f 6c69 6e65 5f5f 3665 6e74 6974 7946 6920 7365 745f 7072 6373 5f6c 696e 655f 5f36 656e 7469 7479 4669 2067 6574
3735520  5f65 6e74 6974 795f 6e61 6d65 5f5f 3665 6e74 6974 7946 7620 6765 745f 656e 7469 7479 5f61 7263 686e 616d 655f 5f36 656e
3735600  7469 7479 4676 2067 6574 5f65 6e74 6974 795f 6669 6c65 5f5f 3665 6e74 6974 7946 7620 6765 745f 656e 7469 7479 5f74 7970
3735660  655f 5f36 656e 7469 7479 4676 205c 0067 6574 5f61 7263 685f 6c69 6e65 5f5f 3665 6e74 6974 7946 7620 6765 745f 6361 6c6c
3735740  5f6c 696e 655f 5f36 656e 7469 7479 4676 2067 6574 5f70 7263 735f 6c69 6e65 5f5f 3665 6e74 6974 7946 7620 6973 4754 455f
3736020  5f36 656e 7469 7479 4650 364f 626a 6563 7420 6973 4c54 455f 5f36 656e 7469 7479 4650 364f 626a 6563 7420 6578 706c 6169
3736100  6e5f 5f36 656e 7469 7479 4650 6320 3b3b 3b00 5f5f 7074 626c 5f5f 3665 6e74 6974 795f 5f44 6563 6f64 6572 5f63 7878 3a47
3736160  2830 2c33 3329 3062 6c6f 636b 3a54 2830 2c31 3030 293d 7331 3430 5f5f 7670 7472 5f5f 364f 626a 6563 743a 2830 2c33 3329
3736240  2c30 2c33 323b 6e61 6d65 5f5f 374e 4f62 6a65 6374 3a28 302c 3230 292c 3332 2c33 323b 6e61 6d65 5f5f 3562 6c6f 636b 3a28
3736320  302c 3230 292c 3634 2c33 323b 7479 7065 5f5f 3562 6c6f 636b 3a28 302c 3129 2c39 362c 3332 3b4d 475f 4e61 6d65 5f5f 3562
3736400  6c6f 636b 3a28 302c 3230 292c 3132 382c 3332 3b4d 475f 5479 7065 5f5f 3562 6c6f 636b 3a28 302c 3230 292c 3136 302c 3332
3736460  3b4d 475f 5375 6254 7970 655f 5f35 626c 6f63 6b3a 2830 2c32 3029 2c31 3932 2c33 323b 5061 7265 6e74 5f5f 3562 6c6f 636b
3736540  3a28 302c 3939 292c 3232 342c 3438 303b 5c00 4d47 4473 6372 7074 6e5f 5f35 626c 6f63 6b3a 2830 2c31 3031 293d 2a28 302c
3736620  3932 292c 3730 342c 3332 3b41 6374 7561 6c5f 5f35 626c 6f63 6b3a 2830 2c38 3829 2c37 3336 2c39 363b 466f 726d 616c 5f5f
3736700  3562 6c6f 636b 3a28 302c 3838 292c 3833 322c 3936 3b52 6573 6f6c 7665 645f 5f35 626c 6f63 6b3a 2830 2c38 3829 2c39 3238
3736760  2c39 363b 4174 7472 6962 7574 6573 5f5f 3562 6c6f 636b 3a28 302c 3838 292c 3130 3234 2c39 363b 3b00 626c 6f63 6b3a 5a63
3737040  626c 6f63 6b3b 4e4f 626a 6563 743b 5f5f 6374 5f5f 3562 6c6f 636b 4676 205f 5f63 745f 5f35 626c 6f63 6b46 5243 3562 6c6f
3737120  636b 205f 5f64 745f 5f35 626c 6f63 6b46 7620 7365 745f 626c 6f63 6b5f 6e61 6d65 5f5f 3562 6c6f 636b 4650 6320 7365 745f
3737200  626c 6f63 6b5f 7479 7065 5f5f 3562 6c6f 636b 4650 6320 6765 745f 626c 6f63 6b5f 6e61 6d65 5f5f 3562 6c6f 636b 4676 2067
3737260  6574 5f62 6c6f 636b 5f74 7970 655f 5f35 626c 6f63 6b46 7620 6765 745f 626c 6f63 6b5f 7061 7265 6e74 5f5f 3562 6c6f 636b
3737340  4676 205c 0067 6574 5f62 6c6f 636b 5f4d 6f64 4765 6e5f 5f35 626c 6f63 6b46 7620 6765 745f 466f 726d 616c 5f5f 3562 6c6f
3737420  636b 4676 2067 6574 5f41 6374 7561 6c5f 5f35 626c 6f63 6b46 7620 6765 745f 5265 736f 6c76 6564 5f5f 3562 6c6f 636b 4676
3737500  2067 6574 5f41 7474 7269 6275 7465 5f5f 3562 6c6f 636b 4676 2067 6574 5f63 6f6d 705f 6c65 6e67 7468 5f5f 3562 6c6f 636b
3737560  4676 2069 7351 7561 6c69 6669 6564 5f5f 3562 6c6f 636b 4676 2069 734c 5445 5f5f 3562 6c6f 636b 4650 364f 626a 6563 7420
3737640  5c00 6973 4754 455f 5f35 626c 6f63 6b46 5036 4f62 6a65 6374 2065 7870 6c61 696e 5f5f 3562 6c6f 636b 4650 6320 5265 7665
3737720  7273 6541 6c6c 4c69 7374 735f 5f35 626c 6f63 6b46 7620 4368 6563 6b50 6172 614c 6973 7473 5f5f 3562 6c6f 636b 4676 2043
```

```
3740000  6865 636b 5061 7261 6d4c 6973 745f 5f35 626c 6f63 6b46 5035 504c 6973 7420 575f 5648 444c 5f43 6f6d 7049 6e73 745f 5f35
3740060  626c 6f63 6b46 7620 575f 5648 444c 5f43 6f6d 7044 6563 5f5f 3562 6c6f 636b 4676 2067 6574 5f56 4844 4c5f 436f 6d70 4c61
3740140  626c 655f 5f35 626c 6f63 6b46 5063 205c 0067 6574 5f56 4844 4c5f 436f 6d70 4e61 6d65 5f5f 3562 6c6f 636b 4650 6320 575f
3740220  4d47 5f43 6f6d 7044 7363 7270 746e 5f5f 3562 6c6f 636b 4676 2057 5f4d 475f 4368 6563 6b43 6f6d 705f 5f35 626c 6f63 6b46
3740300  7620 575f 434c 5f41 7263 6842 6f64 795f 5f35 626c 6f63 6b46 7620 575f 434c 5f45 6e74 6974 7944 6563 5f5f 3562 6c6f 636b
3740360  4676 203b 3b3b 005f 5f70 7462 6c5f 5f35 626c 6f63 6b5f 5f44 6563 6f64 6572 5f63 7878 3a47 2830 2c33 3329 005f 5f63 745f
3740440  5f36 656e 7469 7479 4676 3a66 2830 2c31 3032 293d 2a28 302c 3939 2900 5f5f 3074 6869 733a 7028 302c 3130 3229 002f 686f
3740520  6465 2f6f 7361 7331 2f61 2f61 622f 7372 632f 6e65 776f 626a 6563 7473 2f70 726f 672f 6878 782f 656e 7469 7479 2e68 7878
3740600  005f 5f30 7468 6973 3a72 2830 2c31 3032 2900 5f5f 3074 6869 7320 3a5a 746c 005f 5f63 745f 5f36 656e 7469 7479 4676 203a
3740660  5a74 4600 4465 7369 676e 556e 6974 3a54 2830 2c31 3033 293d 7335 325f 5f76 7074 725f 5f36 4f62 6a65 6374 3a28 302c 3333
3740740  292c 302c 3332 3b6e 616d 655f 5f37 4e4f 626a 6563 743a 2830 2c32 3029 2c33 322c 3332 3b44 6555 6e4e 616d 655f 5f31 3044
3741020  6573 6967 6e55 6e69 743a 2830 2c32 3029 2c36 342c 3332 3b46 696c 654e 616d 655f 5f31 3044 6573 6967 6e55 6e69 743a 2830
3741100  2c32 3029 2c39 362c 3332 3b41 7263 684e 616d 655f 5f31 3044 6573 6967 6e55 6e69 743a 2830 2c32 3029 2c31 3238 2c33 323b
3741160  4465 556e 5479 7065 5f5f 3130 4465 7369 676e 556e 6974 3a28 302c 3129 2c31 3630 2c33 323b 4172 6368 4c69 6e65 5f5f 3130
3741240  4465 7369 676e 556e 6974 3a28 302c 3129 2c31 3932 2c33 323b 5175 616c 6966 6965 645f 5f31 3044 6573 6967 6e55 6e69 743a
3741320  2830 2c38 3829 2c32 3234 2c39 363b 5375 6242 6c6f 636b 735f 5f31 3044 6573 6967 6e55 6e69 743a 2830 2c38 3829 2c33 3230
3741400  2c39 363b 3b00 4465 7369 676e 556e 6974 3a5a 6344 6573 6967 6e55 6e69 743b 4e4f 626a 6563 743b 5f5f 6374 5f5f 3130 4465
3741460  7369 676e 556e 6974 4676 205f 5f63 745f 5f31 3044 6573 6967 6e55 6e69 7446 5063 205f 5f63 745f 5f31 3044 6573 6967 6e55
3741540  6e69 7446 5036 656e 7469 7479 205f 5f63 745f 5f31 3044 6573 6967 6e55 6e69 7446 5243 3130 4465 7369 676e 556e 6974 205f
3741620  5f64 745f 5f31 3044 6573 6967 6e55 6e69 7446 7620 7365 745f 4455 5f44 6555 6e4e 616d 655f 5f31 3044 6573 6967 6e55 6e69
3741700  7446 5063 205c 0073 6574 5f44 555f 4669 6c65 4e61 6465 5f5f 3130 4465 7369 676e 556e 6974 4650 6320 7365 745f 4455 5f41
3741760  7263 684e 616d 655f 5f31 3044 6573 6967 6e55 6e69 7446 5063 2073 6574 5f44 555f 4465 556e 5479 7065 5f5f 3130 4465 7369
3742040  676e 556e 6974 4669 2073 6574 5f44 555f 4172 6368 4c69 6e65 5f5f 3130 4465 7369 676e 556e 6974 4669 2067 6574 5f44 555f
3742120  4669 6c65 4e61 6d65 5f5f 3130 4465 7369 676e 556e 6974 4676 2045 7175 616c 5f5f 3130 4465 7369 676e 556e 6974 4650 3665
3742200  6e74 6974 7920 5c00 6973 4754 455f 5f31 3044 6573 6967 6e55 6e69 7446 5036 4f62 6a65 6374 2069 734c 5445 5f5f 3130 4465
3742260  7369 676e 556e 6974 4650 364f 626a 6563 7420 6765 745f 4455 5f51 7561 6c69 6669 6564 5f5f 3130 4465 7369 676e 556e 6974
3742340  4676 2067 6574 5f44 555f 5375 6242 6c6f 636b 735f 5f31 3044 6573 6967 6e55 6e69 7446 7620 4578 7061 6e64 5f56 4844 4c5f
3742420  4455 5f5f 3130 4465 7369 676e 556e 6974 4676 2065 7870 6c61 696e 5f5f 3130 4465 7369 676e 556e 6974 4650 6320 3b3b 3b00
3742500  5f5f 7074 626c 5f5f 3130 4465 7369 676e 556e 6974 5f5f 4465 636f 6465 725f 6378 783a 4728 332c 3333 2900 4669 6c65 556e
3742560  6974 3a54 2830 2c31 3034 293d 7332 345f 5f76 7074 725f 5f36 4f62 6a65 6374 3a28 302c 3333 292c 302c 3332 3b6e 616d 655f
3742640  5f37 4e4f 626a 6563 743a 2830 2c32 3029 2c33 322c 3332 3b46 696c 654e 616d 655f 5f38 4669 6c65 556e 6974 3a28 302c 3230
3742720  292c 3634 2c33 323b 456e 7469 7479 4c69 7374 5f5f 3846 696c 6555 6e69 743a 2830 2c38 3829 2c39 362c 3936 3b3b 0046 696c
3743000  6555 6e69 743a 5a63 4669 6c65 556e 6974 3b4e 4f62 6a65 6374 3b5f 5f63 745f 5f38 4669 6c65 556e 6974 4676 205f 5f63 745f
3743060  5f38 4669 6c65 556e 6974 4650 6320 5f5f 6374 5f5f 3846 696c 6555 6e69 7446 5243 3846 696c 6555 6e69 7420 5f5f 6474 5f5f
3743140  3846 696c 6555 6e69 7446 7620 7365 745f 4655 5f46 696c 654e 616d 655f 5f38 4669 6c65 556e 6974 4650 6320 6765 745f 4655
3743220  5f46 696c 654e 616d 655f 5f38 4669 6c65 556e 6974 4676 2067 6574 5f45 6e74 6974 794c 6973 745f 5f38 4669 6c65 556e 6974
3743300  4676 205c 0045 7870 616e 645f 5648 444c 5f44 555f 5f38 4669 6c65 556e 6974 4676 2065 7870 6c61 696e 5f5f 3846 696c 6555
3743360  6e69 7446 5063 203b 3b3b 005f 5f70 7462 6c5f 5f38 4669 6c65 556e 6974 5f5f 4465 636f 6465 725f 6378 783a 4728 302c 3333
3743440  2900 416c 6c42 6c6f 636b 733a 5428 302c 3130 3529 3d73 3434 5f5f 7670 7472 5f5f 364f 626a 6563 743a 2830 2c33 3329 2c30
3743520  2c33 323b 6e61 6d65 5f5f 374e 4f62 6a65 6374 3a28 302c 3230 292c 3332 2c33 323b 426c 6f63 6b4c 6973 745f 5f39 416c 6c42
3743600  6c6f 636b 733a 2830 2c38 3829 2c36 342c 3936 3b44 554c 6973 745f 5f39 416c 6c42 6c6f 636b 733a 2830 2c38 3829 2c31 3630
3743660  2c39 363b 4655 4c69 7374 5f5f 3941 6c6c 426c 6f63 6b73 3a28 302c 3838 292c 3235 362c 3936 3b3b 0041 6c6c 426c 6f63 6b73
3743740  3a5a 6341 6c6c 426c 6f63 6b73 3b4e 4f62 6a65 6374 3b5f 5f63 745f 5f39 416c 6c42 6c6f 636b 7346 7620 5f5f 6374 5f5f 3941
3744020  6c6c 426c 6f63 6b73 4652 4339 416c 6c42 6c6f 636b 7320 5f5f 6474 5f5f 3941 6c6c 426c 6f63 6b73 4676 2067 6574 5f42 6c6f
3744100  636b 4c69 7374 5f5f 3941 6c6c 426c 6f63 6b73 4676 2067 6574 5f44 554c 6973 745f 5f39 416c 6c42 6c6f 636b 7346 7620 6765
3744160  745f 4655 4c69 7374 5f5f 3941 6c6c 426c 6f63 6b73 4676 2052 6561 645f 5648 444c 5f42 6c6b 4669 6c65 5f5f 3941 6c6c 426c
3744240  6f63 6b73 4650 6320 5c00 5265 7665 7273 6550 6172 616d 4c69 7374 735f 5f39 416c 6c42 6c6f 636b 7346 7620 6161 6b65 5f44
3744320  554c 6973 745f 5f39 416c 6c42 6c6f 636b 7346 7620 6d61 6b65 5f46 554c 6973 745f 5f39 416c 6c42 6c6f 636b 7346 7620 4578
3744400  7061 6e64 5f56 4844 4c5f 4655 5f5f 3941 6c6c 426c 6f63 6b73 4676 2065 7870 6c61 696e 5f5f 3941 6c6c 426c 6f63 6b73 4650
3744460  6320 3b3b 3b00 5f5f 7074 626c 5f5f 3941 6c6c 426c 6f63 6b73 5f5f 4465 636f 6465 725f 6378 783a 4728 302c 3333 2900 4d47
3744540  5f53 7065 6369 6669 633a 5428 302c 3130 3629 3d73 3132 7465 6368 6e6f 6c6f 6779 5f5f 3131 4d47 5f53 7065 6369 6669 633a
3744620  2830 2c32 3029 2c30 2c33 323b 6c62 735f 7465 6368 4e75 6d5f 5f31 314d 475f 5370 6563 6966 6963 3a28 302c 3129 2c33 322c
3744700  3332 3b4d 656d 5f74 6563 684e 756d 5f5f 3131 4d47 5f53 7065 6369 6669 633a 2830 2c31 292c 3634 2c33 323b 3b00 4d47 5f53
3744760  7065 6369 6669 633a 5a63 4d47 5f53 7065 6369 6669 633b 3b5f 5f63 745f 5f31 314d 475f 5370 6563 6966 6963 4676 205f 5f64
3745040  745f 5f31 314d 475f 5370 6563 6966 6963 4676 2073 6574 5f74 6563 686e 6f6c 6f67 795f 6e61 6d65 5f5f 3131 4d47 5f53 7065
```

```
3745120  6369 6669 6346 5063 2067 6574 5f6c 6273 5f74 6563 684e 756d 5f5f 3131 4d47 5f53 7065 6369 6669 6346 7620 6765 745f 4d65
3745200  6d5f 7465 6368 4e75 6d5f 5f31 314d 475f 5370 6563 6966 6963 4676 2067 6574 5f74 6563 684e 616d 655f 5f31 314d 475f 5370
3745260  6563 6966 6963 4676 205c 0065 7870 6c61 696e 5f5f 3131 4d47 5f53 7065 6369 6669 6346 5063 203b 3b3b 0044 6563 6f64 6572
3745340  3a54 2830 2c31 3737 293d 7335 3642 6974 5769 6474 685f 5f36 446f 6447 656e 3a28 302c 3129 2c30 2c33 323b 4553 7461 7465
3745420  5f5f 364d 6f64 4765 6e3a 2830 2c37 3829 2c33 322c 3332 3b50 696e 4e61 6d65 4c65 6e67 7468 5f5f 364d 6f64 4765 6e3a 2830
3745500  2c38 3929 2c36 342c 3936 3b5f 5f76 7074 725f 5f36 4d6f 6447 656e 3a28 302c 3333 292c 3136 302c 3332 3b74 7970 655f 5f37
3745560  4465 636f 6465 723a 2830 2c32 3029 2c31 3932 2c33 323b 6d61 696e 5f6d 656e 755f 5f37 4465 636f 6465 723a 2830 2c31 292c
3745640  3232 342c 3332 3b73 7562 5f6d 656e 755f 5f37 4465 636f 6465 723a 2830 2c31 292c 3235 362c 3332 3b6d 6f64 756c 656e 616d
3745720  655f 5f37 4465 636f 6465 723a 2830 2c32 3029 2c32 3838 2c33 323b 5c00 6269 7473 5f5f 3744 6563 6f64 6572 3a28 302c 3129
3746000  2c33 3230 2c33 323b 4761 7465 644f 505f 5f37 4465 636f 6465 723a 2830 2c37 3829 2c33 3532 2c33 323b 4163 7469 7665 4869
3746060  4f50 5f5f 3744 6563 6f64 6572 3a28 302c 3738 292c 3338 342c 3332 3b43 6944 7269 7665 5f5f 3744 6563 6f64 6572 3a28 302c
3746140  3738 292c 3431 362c 3332 3b3b 0044 6563 6f64 6572 3a5a 6344 6563 6f64 6572 3b4d 6f64 4765 6e3b 5f5f 6374 5f5f 3744 6563
3746220  6f64 6572 4650 6320 5f5f 6374 5f5f 3744 6563 6f64 6572 4676 205f 5f63 745f 5f37 4465 636f 6465 7246 5243 3744 6563 6f64
3746300  6572 205f 5f64 745f 5f37 4465 636f 6465 7246 7620 7365 744e 616d 6549 6e64 6578 5f5f 3744 6563 6f64 6572 4650 6320 7365
3746360  7449 6e64 6578 5f5f 3744 6563 6f64 6572 4676 204c 6f61 645f 5648 444c 5f44 6174 615f 5f37 4465 636f 6465 7246 5037 4e4f
3746440  626a 6563 7420 436f 6d70 6f73 655f 4d6f 6447 656e 5f44 6573 6372 6970 746f 725f 5f37 4465 636f 6465 7246 5063 205c 003b
3746520  3b3b 005f 5f70 7462 6c5f 5f37 4465 636f 6465 725f 5f44 6563 6f64 6572 5f63 7878 3a47 2830 2c33 3329 0074 656d 704d 473a
3746600  4728 302c 3230 2900 4d47 3a47 2830 2c31 3038 293d 2a28 302c 3130 3629 0073 6574 496e 6465 785f 5f37 4465 636f 6465 7246
3746660  763a 4628 302c 3229 005f 5f30 7468 6973 3a70 2830 2c31 3039 293d 2a28 302c 3130 3729 0044 6563 6f64 6572 2e63 7878 005f
3746740  5f30 7468 6973 203a 5a74 6c00 7365 7449 6e64 6578 5f5f 3744 6563 6f64 6572 4676 203a 5a74 4600 4c6f 6164 5f56 4844 4c5f
3747020  4461 7461 5f5f 3744 6563 6f64 6572 4650 374e 4f62 6a65 6374 3a46 2830 2c32 2900 5f5f 3074 6869 733a 7028 302c 3130 3929
3747100  005f 5f30 4e3a 7028 302c 3836 2900 5f5f 3074 6869 733a 7228 302c 3130 3929 005f 5f31 423a 2830 2c31 3130 293d 2a28 302c
3747160  3130 3029 005f 5f30 5f5f 4b36 353a 2830 2c31 3131 293d 2a28 302c 3838 2900 5f5f 305f 5f4b 3636 3a28 302c 3131 3129 005f
3747240  5f30 5f5f 4b36 373a 2830 2c31 3131 2900 5f5f 305f 5f58 4230 3079 696a 306d 653a 2830 2c37 3829 005f 5f30 7468 6973 203a
3747320  5a74 6c00 5f5f 304e 203a 5a74 6c00 5f5f 3142 203a 5a74 6c00 5f5f 305f 5f4b 3635 203a 5a74 6c00 5f5f 305f 5f4b 3636 203a
3747400  5a74 6c00 5f5f 375f 5f4b 3637 203a 5a74 6c00 4c6f 6164 5f56 4844 4c5f 4461 7461 5f5f 3744 6563 6f64 6572 4650 374e 4f62
3747460  6a65 6374 203a 5a74 4600 436f 6d70 6f73 655f 4d6f 6447 656e 5f44 6573 6372 6970 746f 725f 5f37 4465 636f 6465 7246 5063
3747540  3a46 2830 2c32 3029 005f 5f30 7468 6973 3a70 2830 2c31 3039 2900 5f5f 3062 7566 663a 7028 302c 3230 2900 5f5f 3074 6869
3747620  733a 7228 302c 3130 3929 005f 5f30 7468 6973 203a 5a74 6c00 5f5f 3062 7566 6620 3a5a 746c 0043 6f6d 706f 7365 5f4d 6f64
3747700  4765 6e5f 4465 7363 7269 7074 6f72 5f5f 3744 6563 6f64 6572 4650 6320 3a5a 7446 005f 5f73 7469 5f5f 4465 636f 6465 725f
3747760  6378 785f 7365 7449 6e64 6578 5f3a 4628 302c 3229 002f 7573 722f 4343 2f73 756e 342f 696e 636c 2f69 6f73 7472 6561 6d2e
3750040  6800 5f5f 7374 645f 5f44 6563 6f64 6572 5f63 7878 5f73 6574 496e 6465 785f 3a46 2830 2c32 2900 5f5f 7674 626c 5f5f 3744
3750120  6563 6f64 6572 3a47 2830 2c31 3132 293d 6172 2830 2c31 293b 303b 363b 2830 2c31 3529 005f 5f76 7462 6c5f 5f31 3662 6c6f
3750200  636b 5f61 7474 7269 6275 7465 735f 5f44 6563 6f64 6572 5f63 7878 3a47 2830 2c31 3133 293d 6172 2830 2c31 293b 303b 3130
3750260  3b28 302c 3135 2900 5f5f 7674 626c 5f5f 384c 504f 626a 6563 745f 5f44 6563 6f64 6572 5f63 7878 3a47 2830 2c31 3134 293d
3750340  6172 2830 2c31 293b 303b 333b 2830 2c31 3529 0073 6574 4e61 6d65 496e 6465 785f 5f37 4465 636f 6465 7246 5063 3a66 2830
3750420  2c32 2900 5f5f 3074 6869 733a 7028 302c 3130 3929 005f 5f30 743a 7028 302c 3230 2900 2e2f 6878 782f 4465 636f 6465 722e
3750500  6d78 7900 5f5f 3074 6869 7320 3a5a 746c 005f 5f30 7420 3a5a 746c 0073 6574 4e61 6d65 496e 6465 785f 5f37 4465 636f 6465
3750560  7246 5063 203a 5a74 4600 7365 745f 4655 5f46 696c 654e 616d 655f 5f38 4669 6c65 556e 6974 4650 633a 6628 302c 3229 005f
3750640  5f30 7468 6973 3a70 2830 2c31 3135 293d 2a28 302c 3130 3429 005f 5f30 733a 7028 302c 3230 2900 2f68 6f6d 652f 6f73 6173
3750720  312f 612f 6162 2f73 7263 2f6e 6577 6f62 6a65 6374 732f 7072 6f67 2f68 7878 2f46 696c 6555 6e2e 6878 7800 5f5f 3074 6869
3751000  733a 7228 302c 3131 3529 005f 5f30 7468 6973 203a 5a74 6c00 5f5f 3073 203a 5a74 6c00 7365 745f 4655 5f46 696c 654e 616d
3751060  655f 5f38 4669 6c65 556e 6974 4650 6320 3a5a 7446 0065 7870 6c61 696e 5f5f 3136 626c 6f63 6b5f 6174 7472 6962 7574 6573
3751140  4650 633a 6628 302c 3229 005f 5f30 7468 6973 3a70 2830 2c31 3136 293d 2a28 302c 3938 2900 5f5f 3073 3a70 2830 2c32 3029
3751220  002f 686f 6d65 2f6f 7361 7331 2f61 2f61 622f 7372 632f 6e65 776f 626a 6563 7473 2f70 726f 672f 6878 782f 6174 7472 6962
3751300  7574 652e 6878 7800 5f5f 3074 6869 733a 7228 302c 3131 3629 005f 5f30 7468 6973 203a 5a74 6c00 5f5f 3073 203a 5a74 6c00
3751360  6578 706c 6169 6e5f 5f31 3662 6c6f 636b 5f61 7474 7269 6275 7465 7346 5063 203a 5a74 4600 7365 745f 7061 7261 6d65 7465
3751440  725f 7661 6c75 655f 7479 7065 5f5f 3970 6172 616d 6574 6572 4650 633a 6628 302c 3229 005f 5f30 7468 6973 3a70 2830 2c39
3751520  3729 005f 5f30 733a 7028 302c 3230 2900 2f68 6f6d 652f 6f73 6173 312f 612f 6162 2f73 7263 2f6e 6577 6f62 6a65 6374 732f
3751600  7072 6f67 2f68 7878 2f70 6172 616d 6574 6572 2e68 7878 005f 5f30 7468 6973 3a72 2830 2c39 3729 005f 5f30 7468 6973 203a
3751660  5a74 6c00 5f5f 3073 203a 5a74 6c00 7365 745f 7061 7261 6d65 7465 725f 7661 6c75 655f 7479 7065 5f5f 3970 6172 616d 6574
3751740  6572 4650 6320 3a5a 7446 0065 7870 6c61 696e 5f5f 384c 504f 626a 6563 7446 5063 3a66 2830 2c32 2900 5f5f 3074 6869 733a
3752020  7028 302c 3131 3729 3d2a 2830 2c38 3529 005f 5f30 733a 7028 302c 3230 2900 2f68 6f6d 652f 6f73 6173 312f 612f 6162 2f73
3752100  7263 2f6e 6577 6f62 6a65 6374 732f 6878 782f 4c50 4f62 6a65 6374 5f64 622e 6878 7800 5f5f 3074 6869 733a 7228 302c 3131
3752160  3729 005f 5f30 7468 6973 203a 5a74 6c00 5f5f 3073 203a 5a74 6c00 6578 706c 6169 6e5f 5f38 4c50 4f62 6a65 6374 4650 6320
```

| | | | | | | | | | | | | | | | | | | | | | | | | |
|---|---|---|---|---|---|---|---|---|---|---|---|---|---|---|---|---|---|---|---|---|---|---|---|---|
| 3752240 | 3a5a | 7446 | 0069 | 734c | 5445 | 5f5f | 374e | 4f62 | 6a65 | 6374 | 4650 | 364f | 626a | 6563 | 743a | 6628 | 302c | 3129 | 005f | 5f30 | 7468 | 6973 | 3a70 | 2830 |
| 3752320 | 2c38 | 3629 | 005f | 5f30 | 5f5f | 4133 | 393a | 7028 | 302c | 3131 | 3829 | 3d2a | 2830 | 2c37 | 3929 | 002f | 686f | 6d65 | 2f6f | 7361 | 7331 | 2f61 | 2f61 | 622f |
| 3752400 | 7372 | 632f | 6e65 | 776f | 626a | 6563 | 7473 | 2f68 | 7878 | 2f4e | 4f62 | 6a65 | 6374 | 5f64 | 622e | 6878 | 7800 | 5f5f | 3074 | 6369 | 7320 | 3a5a | 746c | 005f |
| 3752460 | 5f30 | 5f5f | 4133 | 3920 | 3a5a | 746c | 0069 | 734c | 5445 | 5f5f | 374e | 4f62 | 6a65 | 6374 | 4650 | 364f | 626a | 6563 | 7420 | 3a5a | 7446 | 0069 | 7347 | 5445 |
| 3752540 | 5f5f | 374e | 4f62 | 6a65 | 6374 | 4650 | 364f | 626a | 6563 | 743a | 6628 | 302c | 3129 | 005f | 5f30 | 7468 | 6973 | 3a70 | 2830 | 2c38 | 3629 | 005f | 5f30 | 5f5f |
| 3752620 | 4133 | 383a | 7028 | 302c | 3131 | 3829 | 005f | 5f30 | 7468 | 6973 | 203a | 5a74 | 6c00 | 5f5f | 305f | 5f41 | 3338 | 203a | 5a74 | 6c00 | 6973 | 4754 | 455f | 5f37 |
| 3752700 | 4e4f | 626a | 6563 | 7446 | 5036 | 4f62 | 6a65 | 6374 | 203a | 5a74 | 4600 | 7365 | 7450 | 726f | 705f | 5f37 | 4e4f | 626a | 6563 | 7446 | 5063 | 663a | 6628 | 302c |
| 3752760 | 3229 | 005f | 5f30 | 7468 | 6973 | 3a70 | 2830 | 2c38 | 3629 | 005f | 5f31 | 5f5f | 4133 | 363a | 7028 | 302c | 3230 | 2900 | 5f5f | 315f | 5f41 | 3337 | 3a70 | 2830 |
| 3753040 | 2c31 | 3029 | 005f | 5f30 | 7468 | 6973 | 203a | 5a74 | 6c00 | 5f5f | 315f | 5f41 | 3336 | 203a | 5a74 | 6c00 | 5f5f | 315f | 5f41 | 3337 | 203a | 5a74 | 6c00 | 7365 |
| 3753120 | 7450 | 726f | 705f | 5f37 | 4e4f | 626a | 6563 | 7446 | 5063 | 6620 | 3a5a | 7446 | 0073 | 6574 | 5072 | 6f70 | 5f5f | 374e | 4f62 | 6a65 | 6374 | 4650 | 6369 | 3a66 |
| 3753200 | 2830 | 2c32 | 2900 | 5f5f | 3074 | 6869 | 733a | 7028 | 302c | 3836 | 2900 | 5f5f | 315f | 5f41 | 3334 | 3a70 | 2830 | 2c32 | 3029 | 005f | 5f31 | 5f5f | 4133 | 353a |
| 3753260 | 7028 | 302c | 3129 | 005f | 5f30 | 7468 | 6973 | 203a | 5a74 | 6c00 | 5f5f | 315f | 5f41 | 3334 | 203a | 5a74 | 6c00 | 5f5f | 315f | 5f41 | 3335 | 203a | 5a74 | 6c00 |
| 3753340 | 7365 | 7450 | 726f | 705f | 5f37 | 4e4f | 626a | 6563 | 7446 | 5063 | 6920 | 3a5a | 7446 | 0073 | 6574 | 5072 | 6f70 | 5f5f | 374e | 4f62 | 6a65 | 6374 | 4650 | 6354 |
| 3753420 | 313a | 6628 | 302c | 3229 | 005f | 5f30 | 7468 | 6973 | 3a70 | 2830 | 2c38 | 3629 | 005f | 5f31 | 5f5f | 4133 | 323a | 7028 | 302c | 3230 | 2900 | 5f5f | 315f | 5f41 |
| 3753500 | 3333 | 3a70 | 2830 | 2c32 | 3029 | 005f | 5f30 | 7468 | 6973 | 203a | 5a74 | 6c00 | 5f5f | 315f | 5f41 | 3332 | 203a | 5a74 | 6c00 | 5f5f | 315f | 5f41 | 3333 | 203a |
| 3753560 | 5a74 | 6c00 | 7365 | 7450 | 726f | 705f | 5f37 | 4e4f | 626a | 6563 | 7446 | 5063 | 5431 | 203a | 5a74 | 4600 | 6765 | 7450 | 726f | 705f | 5f37 | 4e4f | 626a | 6563 |
| 3753640 | 7446 | 5063 | 693a | 6628 | 302c | 3230 | 2900 | 5f5f | 3074 | 6869 | 733a | 7028 | 302c | 3836 | 2900 | 5f5f | 305f | 5f41 | 3330 | 3a70 | 2830 | 2c32 | 3029 | 005f |
| 3753720 | 5f30 | 5f5f | 4133 | 313a | 7028 | 302c | 3129 | 005f | 5f30 | 7468 | 6973 | 203a | 5a74 | 6c00 | 5f5f | 305f | 5f41 | 3330 | 203a | 5a74 | 6c00 | 5f5f | 305f | 5f41 |
| 3754000 | 3331 | 203a | 5a74 | 6c00 | 6765 | 7450 | 726f | 705f | 5f37 | 4e4f | 626a | 6563 | 7446 | 5063 | 6920 | 3a5a | 7446 | 0067 | 6574 | 4174 | 7472 | 5f5f | 374e | 4f62 |
| 3754060 | 6a65 | 6374 | 4669 | 3a66 | 2830 | 2c32 | 3029 | 005f | 5f30 | 7468 | 6973 | 3a70 | 2830 | 2c38 | 3629 | 005f | 5f30 | 5f5f | 4132 | 393a | 7028 | 302c | 3129 | 005f |
| 3754140 | 5f30 | 7468 | 6973 | 203a | 5a74 | 6c00 | 5f5f | 305f | 5f41 | 3239 | 203a | 5a74 | 6c00 | 6765 | 7441 | 7474 | 725f | 5f37 | 4e4f | 626a | 6563 | 7446 | 6920 | 3a5a |
| 3754220 | 7446 | 0069 | 6e4f | 7264 | 6572 | 5f5f | 364f | 626a | 6563 | 7446 | 5036 | 4f62 | 6a65 | 6374 | 3a66 | 2830 | 2c31 | 2900 | 5f5f | 3074 | 6869 | 733a | 7028 | 302c |
| 3754300 | 3131 | 3829 | 005f | 5f30 | 5f5f | 4132 | 373a | 7028 | 302c | 3131 | 3829 | 002f | 686f | 6d65 | 2f6f | 7361 | 7331 | 2f61 | 2f61 | 622f | 7372 | 632f | 6e65 | 776f |
| 3754360 | 626a | 6563 | 7473 | 2f68 | 7878 | 2f4f | 626a | 6563 | 745f | 6462 | 2e68 | 7878 | 005f | 5f30 | 7468 | 6973 | 203a | 5a74 | 6c00 | 5f5f | 305f | 5f41 | 3237 | 203a |
| 3754440 | 5a74 | 6c00 | 696e | 4f72 | 6465 | 725f | 5f36 | 4f62 | 6a65 | 6374 | 4650 | 364f | 626a | 6563 | 7420 | 3a5a | 7446 | 0044 | 4963 | 7265 | 6d65 | 6e74 | 6f72 | 2e6f |
| 3754520 | 005f | 7365 | 745f | 7061 | 7261 | 6d65 | 7465 | 725f | 7661 | 6c75 | 655f | 7479 | 7065 | 5f5f | 3970 | 6172 | 616d | 6574 | 6572 | 4650 | 6300 | 5f73 | 6574 | 5072 |
| 3754600 | 6f70 | 5f5f | 374e | 4f62 | 6a65 | 6374 | 4650 | 6366 | 005f | 7365 | 7450 | 726f | 705f | 5f37 | 4e4f | 626a | 6563 | 7446 | 5063 | 6900 | 5f65 | 7870 | 6c61 | 696e |
| 3754660 | 5f5f | 3136 | 626c | 6f63 | 6b5f | 6174 | 7472 | 6962 | 7574 | 6573 | 4650 | 6300 | 5f67 | 6574 | 4174 | 7472 | 5f5f | 374e | 4f62 | 6a65 | 6374 | 4669 | 005f | 7365 |
| 3754740 | 745f | 4655 | 5f46 | 696c | 654e | 616d | 655f | 5f38 | 4669 | 6c65 | 556e | 6974 | 4650 | 6300 | 5f70 | 7574 | 5f5f | 376f | 7374 | 7265 | 616d | 4663 | 005f | 7365 |
| 3755020 | 7450 | 726f | 705f | 5f37 | 4e4f | 626a | 6563 | 7446 | 5063 | 5431 | 005f | 7365 | 744e | 616d | 6549 | 6e64 | 6578 | 5f5f | 3131 | 4449 | 6372 | 656d | 656e | 746f |
| 3755100 | 7246 | 5063 | 005f | 696f | 7374 | 7265 | 616d | 5f69 | 6e69 | 7400 | 5f69 | 734c | 5445 | 5f5f | 374e | 4f62 | 6a65 | 6374 | 4650 | 364f | 626a | 6563 | 7400 | 5f69 |
| 3755160 | 7347 | 5445 | 5f5f | 374e | 4f62 | 6a65 | 6374 | 4650 | 364f | 626a | 6563 | 7400 | 5f65 | 7870 | 6c61 | 696e | 5f5f | 384c | 504f | 626a | 6563 | 7446 | 5063 | 005f |
| 3755240 | 6765 | 7450 | 726f | 705f | 5f37 | 4e4f | 626a | 6563 | 7446 | 5063 | 6900 | 5f5f | 5f63 | 745f | 5f36 | 656e | 7469 | 7479 | 4676 | 005f | 696e | 4f72 | 6465 | 725f |
| 3755320 | 5f36 | 4f62 | 6a65 | 6374 | 4650 | 364f | 626a | 6563 | 7400 | 2f68 | 6f6d | 652f | 6f73 | 6173 | 312f | 612f | 6162 | 2f73 | 7263 | 2f6e | 6577 | 6f62 | 6a65 | 6374 |
| 3755400 | 732f | 7072 | 6f67 | 2f4d | 472f | 432b | 2b2e | 3232 | 3836 | 332f | 0044 | 4963 | 7265 | 6d65 | 6e74 | 6f72 | 2e63 | 0044 | 4963 | 7265 | 6d65 | 6e74 | 6f72 | 2e63 |
| 3755460 | 7378 | 0069 | 6e74 | 3a74 | 2830 | 2c31 | 293d | 7228 | 302c | 3129 | 3b2d | 3231 | 3437 | 3438 | 3336 | 3438 | 3b32 | 3134 | 3734 | 3833 | 3634 | 373b | 0063 | 6861 |
| 3755540 | 723a | 7428 | 302c | 3229 | 3d72 | 2830 | 2c32 | 293b | 303b | 3132 | 373b | 006c | 6f6e | 673a | 7428 | 302c | 3329 | 3d72 | 2830 | 2c31 | 293b | 2d32 | 3134 | 3734 |
| 3755620 | 3833 | 3634 | 383b | 3231 | 3437 | 3438 | 3336 | 3437 | 3b00 | 7368 | 6f72 | 743a | 7428 | 302c | 3429 | 3d72 | 2830 | 2c31 | 293b | 2d33 | 3237 | 3638 | 3b33 | 3237 |
| 3755700 | 3637 | 3b00 | 756e | 7369 | 676e | 6564 | 2063 | 6861 | 723a | 7428 | 302c | 3529 | 3d72 | 2830 | 2c31 | 293b | 303b | 3235 | 353b | 0075 | 6e73 | 6967 | 6e65 | 6420 |
| 3755760 | 7368 | 6f72 | 743a | 7428 | 302c | 3629 | 3d72 | 2830 | 2c31 | 293b | 303b | 3635 | 3533 | 353b | 0075 | 6e73 | 6967 | 6e65 | 6420 | 6c6f | 6e67 | 3a74 | 2830 | 2c37 |
| 3756040 | 293d | 7228 | 302c | 3129 | 3b30 | 3b2d | 313b | 0075 | 6e73 | 6967 | 6e65 | 6420 | 696e | 743a | 7428 | 302c | 3829 | 3d72 | 2830 | 2c31 | 293b | 303b | 2d31 | 3b00 |
| 3756120 | 666c | 6f61 | 743a | 7428 | 302c | 3929 | 3d72 | 2830 | 2c31 | 293b | 343b | 303b | 0064 | 6f75 | 626c | 653a | 7428 | 302c | 3130 | 293d | 7228 | 302c | 3129 | 3b38 |
| 3756200 | 3b30 | 3b00 | 766f | 6964 | 3a74 | 2830 | 2c31 | 3129 | 3d28 | 302c | 3131 | 2900 | 3f3f | 3f3a | 7428 | 302c | 3132 | 293d | 2830 | 2c31 | 2900 | 5f5f | 7670 | 7470 |
| 3756260 | 3a74 | 2830 | 2c31 | 3329 | 3d2a | 2830 | 2c31 | 3429 | 3d66 | 2830 | 2c31 | 2900 | 5f5f | 6d70 | 7472 | 3a54 | 2830 | 2c31 | 3529 | 3d73 | 3864 | 3a28 | 302c | 3429 |
| 3756340 | 2c30 | 2c31 | 363b | 693a | 2830 | 2c34 | 292c | 3136 | 2c31 | 363b | 663a | 2830 | 2c31 | 3329 | 2c33 | 322c | 3332 | 3b3b | 005f | 5046 | 565f | 3a74 | 2830 | 2c31 |
| 3756420 | 3629 | 3d2a | 2830 | 2c31 | 3729 | 3d66 | 2830 | 2c32 | 2900 | 5f50 | 4649 | 5f3a | 7428 | 302c | 3133 | 2900 | 6572 | 726e | 6f3a | 4728 | 302c | 3129 | 0073 | 7973 |
| 3756500 | 5f6e | 6572 | 723a | 4728 | 302c | 3129 | 0065 | 6e76 | 6972 | 6f6e | 3a47 | 2830 | 2c31 | 3929 | 3d2a | 2830 | 2c32 | 3029 | 3d2a | 2830 | 2c32 | 2900 | 656e | 643a |
| 3756560 | 4728 | 302c | 3129 | 0065 | 7465 | 7874 | 3a47 | 2830 | 2c31 | 2900 | 6564 | 6174 | 613a | 4728 | 302c | 3129 | 006f | 7074 | 6172 | 673a | 4728 | 302c | 3230 | 2900 |
| 3756640 | 6f70 | 7469 | 6e64 | 3a47 | 2830 | 2c31 | 2900 | 6f70 | 7465 | 7272 | 3a47 | 2830 | 2c31 | 2900 | 7074 | 7264 | 6966 | 665f | 743a | 7428 | 302c | 3129 | 0073 | 697a |
| 3756720 | 655f | 743a | 7428 | 302c | 3829 | 0073 | 7472 | 6561 | 6d70 | 6f73 | 3a74 | 2830 | 2c31 | 2900 | 7374 | 7265 | 616d | 6f66 | 663a | 7428 | 302c | 3129 | 0069 | 6f5f |
| 3757000 | 7374 | 6174 | 653a | 5428 | 302c | 3231 | 293d | 6567 | 5f6f | 6462 | 6974 | 5f5f | 696f | 5f73 | 7461 | 7465 | 3a30 | 2c65 | 6f66 | 6269 | 745f | 5f69 | 6f5f | 7374 |
| 3757060 | 6174 | 653a | 312c | 6661 | 696c | 6269 | 745f | 5f69 | 6f5f | 7374 | 6174 | 653a | 322c | 6261 | 6462 | 6974 | 5f5f | 696f | 5f73 | 7461 | 7465 | 3a33 | 2c68 | 6172 |
| 3757140 | 6466 | 6169 | 6c5f | 5f69 | 6f5f | 7374 | 6174 | 653a | 342c | 3b00 | 6f70 | 656e | 5f6d | 6f64 | 653a | 5428 | 302c | 3232 | 293d | 6569 | 6e5f | 5f6f | 7065 | 6e5f |
| 3757220 | 6d6f | 6465 | 3a30 | 2c6f | 7574 | 5f5f | 6f70 | 656e | 5f6d | 6f64 | 653a | 312c | 6174 | 655f | 5f6f | 7065 | 6e5f | 6d6f | 6465 | 3a32 | 2c61 | 7070 | 5f5f | 6f70 |
| 3757300 | 656e | 5f6d | 6f64 | 653a | 332c | 7472 | 756e | 635f | 5f6f | 7065 | 6e5f | 6d6f | 6465 | 3a34 | 2c6e | 6f63 | 7265 | 6174 | 655f | 5f6f | 7065 | 6e5f | 6d6f | 6465 |

```
3757360 3a35 2c6e 6f72 6570 6c61 6365 5f5f 6f70 656e 5f64 6f64 653a 362c 3b00 7365 656b 5f64 6972 3a54 2830 2c32 3329 3d65 6265
3757440 675f 5f73 6565 6b5f 6469 723a 302c 6375 725f 5f73 6565 6b5f 6469 723a 312c 656e 645f 5f73 6565 6b5f 6469 723a 322c 3b00
3757520 5f5f 4531 3a54 2830 2c32 3429 3d65 736b 5970 7773 5f5f 5f5f 4531 3a30 2c6c 6566 745f 5f5f 5f45 313a 312c 7269 6768 745f
3757600 5f5f 5f45 313a 322c 696e 7465 726e 616c 5f5f 5f5f 4531 3a33 2c64 6563 5f5f 5f5f 4531 3a34 2c6f 6374 5f5f 5f5f 4531 3a35
3757660 2c68 6578 5f5f 5f5f 4531 3a36 2c73 686f 7762 6173 655f 5f5f 5f45 313a 372c 5c00 7368 6f77 706f 696e 745f 5f5f 5f45 313a
3757740 382c 7570 7065 7263 6173 655f 5f5f 5f45 313a 392c 7368 6f77 706f 735f 5f5f 5f45 313a 3130 2c73 6369 656e 7469 6669 635f
3760020 5f5f 5f45 313a 3131 2c66 6978 6564 5f5f 5f5f 4531 3a31 322c 756e 6974 6275 665f 5f5f 5f45 313a 3133 2c73 7464 696f 5f5f
3760100 5f5f 4531 3a31 342c 3b00 5f5f 4532 3a54 2830 2c32 3529 3d65 736b 6970 7069 6e67 5f5f 5f5f 4532 3a30 2c74 6965 645f 5f5f
3760160 5f45 323a 312c 3b00 696f 733a 5428 302c 3236 293d 7336 306e 7573 6572 5f5f 3369 6f73 3a28 302c 3129 2c30 2c33 323b 785f
3760240 7573 6572 5f5f 3369 6f73 3a28 302c 3330 293d 2a28 302c 3237 293d 7875 696f 735f 7573 6572 5f75 6e69 6f6e 3a2c 3332 2c33
3760320 323b 6270 5f5f 3369 6f73 3a28 302c 3331 293d 2a28 302c 3238 293d 7873 7374 7265 616d 6275 663a 2c36 342c 3332 3b73 7461
3760400 7465 5f5f 3369 6f73 3a28 302c 3129 2c39 362c 3332 3b69 7370 6563 6961 6c5f 5f33 696f 733a 2830 2c31 292c 3132 382c 3332
3760460 3b6f 7370 6563 6961 6c5f 5f33 696f 733a 2830 2c31 292c 3136 302c 3332 3b69 7366 785f 7370 6563 6961 6c5f 5f33 696f 733a
3760540 2830 2c31 292c 3139 322c 3332 3b6f 7366 785f 7370 6563 6961 6c5f 5f33 696f 733a 2830 2c31 292c 3232 342c 3332 3b5c 0064
3760620 656c 6275 665f 5f33 696f 733a 2830 2c31 292c 3235 362c 3332 3b78 5f74 6965 5f5f 3369 6f73 3a28 302c 3332 293d 2a28 302c
3760700 3239 293d 7873 6f73 7472 6561 6d3a 2c32 3838 2c33 323b 785f 666c 6167 735f 5f33 696f 733a 2830 2c31 292c 3332 302c 3332
3760760 3b78 5f70 7265 6369 7369 6f6e 5f5f 3369 6f73 3a28 302c 3429 2c33 3532 2c31 363b 785f 6669 6c6c 5f5f 3369 6f73 3a28 302c
3761040 3229 2c33 3638 2c38 3b78 5f77 6964 7468 5f5f 3369 6f73 3a28 302c 3429 2c33 3834 2c31 363b 6173 7369 676e 5f70 7269 7661
3761120 7465 5f5f 3369 6f73 3a28 302c 3129 2c34 3136 2c33 323b 5f5f 7670 7472 5f5f 3369 6f73 3a28 302c 3333 293d 2a28 302c 3135
3761200 292c 3434 382c 3332 3b3b 0062 6173 6566 6965 6c64 5f5f 3369 6f73 3a47 2830 2c31 2900 6164 6a75 7374 6669 656c 645f 5f33
3761260 696f 733a 4728 302c 3129 0066 6c6f 6174 6669 656c 645f 5f33 696f 733a 4728 302c 3129 006e 6578 7462 6974 5f5f 3369 6f73
3761340 3a47 2830 2c31 2900 6e65 7874 776f 7264 5f5f 3369 6f73 3a47 2830 2c31 2900 7374 6469 6f66 6c75 7368 5f5f 3369 6f73 3a47
3761420 2930 2c31 3629 0069 6f73 3a5a 6369 6f73 3b3b 5f5f 6374 5f5f 3369 6f73 4650 3973 7472 6561 6d62 7566 205f 5f63 745f 5f33
3761500 696f 7346 7620 5f5f 6374 5f5f 3369 6f73 4652 3369 6f73 205f 5f64 745f 5f33 696f 7346 7620 666c 6167 735f 5f33 696f 7346
3761560 7620 666c 6167 735f 5f33 696f 7346 6c20 7365 7466 5f5f 3369 6f73 466c 5431 2073 6574 665f 5f33 696f 7346 6c20 756e 7365
3761640 7466 5f5f 3369 6f73 466c 2077 6964 7468 5f5f 3369 6f73 4676 2077 6964 7468 5f5f 3369 6f73 4669 2074 6965 5f5f 3369 6f73
3761720 4650 376f 7374 7265 616d 205c 0074 6955 5f5f 3369 6f73 4676 2066 696c 6c5f 5f33 696f 7346 6320 6669 6c6c 5f5f 3369 6f73
3762000 4676 2070 7265 6369 7369 6f6e 5f5f 3369 6f73 4669 2070 7265 6369 7369 6f6e 5f5f 3369 6f73 4676 2072 6473 7461 7465 5f5f
3762060 3369 6f73 4676 205f 5f6f 7050 765f 5f33 696f 7346 7620 5f5f 6e74 5f5f 3369 6f73 4676 2065 6f66 5f5f 3369 6f73 4676 2066
3762140 6169 6c5f 5f33 696f 7346 7620 6261 645f 5f33 696f 7346 7620 676f 6f64 5f5f 3369 6f73 4676 2063 6c65 6172 5f5f 3369 6f73
3762220 4669 2072 6462 7566 5f5f 3369 6f73 4676 205c 0069 776f 7264 5f5f 3369 6f73 4669 2070 776f 7264 5f5f 3369 6f73 4669 2062
3762300 6974 616c 6c6f 635f 5f33 696f 7353 4676 2078 616c 6c6f 635f 5f33 696f 7353 4676 2075 7265 7369 7a65 5f5f 3369 6f73 4669
3762360 2073 796e 635f 7769 7468 5f73 7464 696f 5f5f 3369 6f73 5346 7620 7365 7473 7461 7465 5f5f 3369 6f73 4669 2069 6e69 745f
3762440 5f33 696f 7346 5039 7374 7265 616d 6275 6620 5f5f 6173 5f5f 3369 6f73 4652 3369 6f73 2073 6b69 705f 5f33 696f 7346 6920
3762520 3b62 6173 6566 6965 6c64 5f5f 3369 6f73 205c 0061 646a 7573 7466 6965 6c64 5f5f 3369 6f73 2066 6c6f 6174 6669 656c 645f
3762600 5f33 696f 7320 6e65 7874 6269 745f 5f33 696f 7320 6e65 7874 776f 7264 5f5f 3369 6f73 2073 7464 696f 666c 7573 685f 5f33
3762660 696f 7320 3b3b 0073 7472 6561 6d62 7566 3a54 2830 2c32 3829 3d73 3430 616c 6c6f 635f 5f39 7374 7265 616d 6275 663a 2830
3762740 2c34 292c 302c 3136 3b78 5f75 6e62 7566 5f5f 3973 7472 6561 6d62 7566 3a28 302c 3429 2c31 362c 3136 3b78 5f62 6173 655f
3763020 5f39 7374 7265 616d 6275 663a 2830 2c32 3029 2c33 322c 3332 3b78 5f70 6261 7365 5f5f 3973 7472 6561 6d62 7566 3a28 302c
3763100 3230 292c 3634 2c33 323b 785f 7070 7472 5f5f 3973 7472 6561 6d62 7566 3a28 302c 3230 292c 3936 2c33 323b 785f 6570 7074
3763160 725f 5f39 7374 7265 616d 6275 663a 2830 2c32 3029 2c31 3238 2c33 323b 785f 6770 7472 5f5f 3973 7472 6561 6d62 7566 3a28
3763240 302c 3230 292c 3136 302c 3332 3b78 5f65 6770 7472 5f5f 3973 7472 6561 6d62 7566 3a28 302c 3230 292c 3139 322c 3332 3b5c
3763320 0078 5f65 6261 636b 5f5f 3973 7472 6561 6d62 7566 3a28 302c 3230 292c 3232 342c 3332 3b78 5f62 6c65 6e5f 5f39 7374 7265
3763400 616d 6275 663a 2830 2c31 292c 3235 362c 3332 3b5f 5f76 7074 725f 5f39 7374 7265 616d 6275 663a 2830 2c33 3329 2c32 3838
3763460 2c33 323b 3b00 7374 7265 616d 6275 663a 5a63 7374 7265 616d 6275 663b 3b5f 5f63 745f 5f39 7374 7265 616d 6275 6646 5239
3763540 7374 7265 616d 6275 6620 5f5f 6374 5f5f 3973 7472 6561 6d62 7566 4676 205f 5f63 745f 5f39 7374 7265 616d 6275 6646 5063
3763620 6920 5f5f 6374 5f5f 3973 7472 6561 6d62 7566 4650 6369 5432 205f 5f61 735f 5f39 7374 7265 616d 6275 6646 5239 7374 7265
3763700 616d 6275 6620 6462 705f 5f39 7374 7265 616d 6275 6646 7620 6261 7365 5f5f 3973 7472 6561 6d62 7566 4676 2070 6261 7365
3763760 5f5f 3973 7472 6561 6d62 7566 4676 205c 0070 7074 725f 5f39 7374 7265 616d 6275 6646 7620 6570 7074 725f 5f39 7374 7265
3764040 616d 6275 6646 7620 6770 7472 5f5f 3973 7472 6561 6d62 7566 4676 2065 6770 7472 5f5f 3973 7472 6561 6d62 7566 4676 2065
3764120 6261 636b 5f5f 3973 7472 6561 6d62 7566 4676 2065 6275 665f 5f39 7374 7265 616d 6275 6646 7620 626c 656e 5f5f 3973 7472
3764200 6561 6d62 7566 4676 2073 6574 705f 5f39 7374 7265 616d 6275 6646 5063 5431 2073 6574 675f 5f39 7374 7265 616d 6275 6646
3764260 5063 4e32 3120 7062 756d 705f 5f39 7374 7265 616d 6275 6646 6920 5c00 6762 756d 705f 5f39 7374 7265 616d 6275 6646 6920
3764340 7365 7462 5f5f 3973 7472 6561 6d62 7566 4650 6354 3169 2075 6e62 7566 6665 7265 645f 5f39 7374 7265 616d 6275 6646 7620
3764420 756e 6275 6666 6572 6564 5f5f 3973 7472 6561 6d62 7566 4669 2061 6c6c 6f63 6174 655f 5f39 7374 7265 616d 6275 6646 7620
```

```
3764500 646f 616c 5c6f 6361 7465 5f5f 3973 7472 6561 6d62 7566 4676 206f 7665 7266 6c6f 775f 5f39 7374 7265 616d 6275 6646 6920
3764560 756e 6465 7266 6c6f 775f 5f39 7374 7265 616d 6275 6646 7620 5c00 7062 6163 6b66 6169 6c5f 5f39 7374 7265 616d 6275 6646
3764640 6920 7379 6e63 5f5f 3973 7472 6561 6d62 7566 4676 2073 6565 6b6f 6666 5f5f 3973 7472 6561 6d62 7566 466c 3873 6565 6b5f
3764720 6469 7269 2073 6565 6b70 6f73 5f5f 3373 7472 6561 6d62 7566 466c 6920 7873 7075 746e 5f5f 3973 7472 6561 6d62 7566 4650
3765000 4363 6920 7873 6765 746e 5f5f 3973 7472 6561 6d62 7566 4650 6369 2069 6e5f 6176 6169 6c5f 5f39 7374 7265 616d 6275 6646
3765060 7620 6f75 745f 7761 6974 696e 675f 5f39 7374 7265 616d 6275 6646 7620 5c00 7367 6574 635f 5f39 7374 7265 616d 6275 6646
3765140 7620 736e 6578 7463 5f5f 3973 7472 6561 6d62 7566 4676 2073 6275 6d70 635f 5f39 7374 7265 616d 6275 6646 7620 7374 6f73
3765220 7363 5f5f 3973 7472 6561 6d62 7566 4676 2073 7075 7462 6163 6b63 5f5f 3973 7472 6561 6d62 7566 4663 2073 7075 7463 5f5f
3765300 3973 7472 6561 6d62 7566 4669 2073 7075 746e 5f5f 3973 7472 6561 6d62 7566 4650 4363 6920 7367 6574 6e5f 5f39 7374 7265
3765360 616d 6275 6646 5063 6920 7365 7462 7566 5f5f 3973 7472 6561 6d62 7566 4650 6369 205c 0073 6574 6275 665f 5f39 7374 7265
3765440 616d 6275 6646 5055 6369 2073 6574 6275 665f 5f39 7374 7265 616d 6275 6646 5063 6954 3220 5f5f 6474 5f5f 3973 7472 6561
3765520 6d62 7566 4676 2078 5f73 6e65 7874 635f 5f39 7374 7265 616d 6275 6646 7620 3b3b 3b00 6973 7472 6561 6d3a 5428 302c 3334
3765600 293d 7337 3278 5f67 636f 756e 745f 5f37 6973 7472 6561 6d3a 2830 2c31 292c 302c 3332 3b5f 5f76 7074 725f 5f37 6973 7472
3765660 6561 6d3a 2830 2c33 3329 2c33 322c 3332 3b50 696f 733a 2830 2c33 3529 3d2a 2830 2c32 3629 2c36 342c 3332 3b4f 696f 733a
3765740 2830 2c32 3629 2c39 362c 3438 303b 3b00 6973 7472 6561 6d3a 5a63 6973 7472 6561 6d3b 696f 733b 5f5f 6374 5f5f 3769 7374
3766020 7265 616d 4650 3973 7472 6561 6d62 7566 205f 5f63 745f 5f37 6973 7472 6561 6d46 7620 5f5f 6374 5f5f 3769 7374 7265 616d
3766100 4650 3973 7472 6561 6d62 7566 6950 376f 7374 7265 616d 205f 5f63 745f 5f37 6973 7472 6561 6d46 6950 6354 3120 5f5f 6374
3766160 5f5f 3769 7374 7265 616d 4669 5431 5037 6f73 7472 6561 6d20 5f5f 6374 5f5f 3769 7374 7265 616d 4652 3769 7374 7265 616d
3766240 205f 5f64 745f 5f37 6973 7472 6561 6d46 7620 5c00 6970 6678 5f5f 3769 7374 7265 616d 4669 2069 7366 785f 5f37 6973 7472
3766320 6561 6d46 7620 7365 656b 675f 5f37 6973 7472 6561 6d46 6c20 7365 656b 675f 5f37 6973 7472 6561 6d46 6c38 7365 656b 5f64
3766400 6972 2074 656c 6c67 5f5f 3769 7374 7265 616d 4676 205f 5f72 735f 5f37 6973 7472 6561 6d46 5046 5237 6973 7472 6561 6d5f
3766460 5237 6973 7472 6561 6d20 5f5f 7273 5f5f 3769 7374 7265 616d 4650 4652 3369 6f73 5f52 3369 6f73 205f 5f72 735f 5f37 6973
3766540 7472 6561 6d46 5063 205f 5f72 735f 5f37 6973 7472 6561 6d46 5055 6320 5c00 5f5f 7273 5f5f 3769 7374 7265 616d 4652 5563
3766620 205f 5f72 735f 5f37 6973 7472 6561 6d46 5263 205f 5f72 735f 5f37 6973 7472 6561 6d46 5273 205f 5f72 735f 5f37 6973 7472
3766700 6561 6d46 5269 205f 5f72 735f 5f37 6973 7472 6561 6d46 526c 205f 5f72 735f 5f37 6973 7472 6561 6d46 5255 7320 5f5f 7273
3766760 5f5f 3769 7374 7265 616d 4652 5569 205f 5f72 735f 5f37 6973 7472 6561 6d46 5255 6c20 5f5f 7273 5f5f 3769 7374 7265 616d
3767040 4652 6620 5f5f 7273 5f5f 3769 7374 7265 6164 4652 6420 5f5f 7273 5f5f 3769 7374 7265 616d 4650 3973 7472 6561 6d62 7566
3767120 205c 0067 6574 5f5f 3769 7374 7265 616d 4650 6369 6320 6765 745f 5f37 6973 7472 6561 6d46 5055 6369 6320 6765 745f 5f37
3767200 6973 7472 6561 6d46 5239 7374 7265 616d 6275 6663 2067 6574 5f5f 3769 7374 7265 616d 4652 5563 2067 6574 5f5f 3769 7374
3767260 7265 616d 4652 6320 6765 745f 5f37 6973 7472 6561 6d46 7620 6765 746c 696e 655f 5f37 6973 7472 6561 6d46 5063 6963 2067
3767340 6574 6c69 6e65 5f5f 3769 7374 7265 616d 4650 5563 6963 2070 6565 6b5f 5f37 6973 7472 6561 6d46 7620 6967 6e6f 7265 5f5f
3767420 3769 7374 7265 616d 4669 5431 205c 0072 6561 645f 5f37 6973 7472 6561 6d46 5063 6920 7265 6164 5f5f 3769 7374 7265 616d
3767500 4650 5563 6920 6763 6f75 6e74 5f5f 3769 7374 7265 616d 4676 2070 7574 6261 636b 5f5f 3769 7374 7265 616d 4663 2073 796e
3767560 635f 5f37 6973 7472 6561 6d46 7620 646f 5f69 7066 785f 5f37 6973 7472 6561 6d46 6920 6561 7477 6869 7465 5f5f 3769 7374
3767640 7265 616d 4676 2078 6765 745f 5f37 6973 7472 6561 6d46 5063 203b 3b3b 006f 7374 7265 616d 3a54 2830 2c32 3929 3d73 3638
3767720 5f5f 7670 7472 5f5f 376f 7374 7265 616d 3a28 302c 3333 292c 302c 3332 3b50 696f 733a 2830 2c33 3529 2c33 322c 3332 3b4f
3770000 696f 733a 2830 2c32 3629 2c36 342c 3438 303b 3b00 6f73 7472 6561 6d3a 5a63 6f73 7472 6561 6d3b 696f 733b 5f5f 6374 5f5f
3770060 376f 7374 7265 616d 4650 3973 7472 6561 6d62 7566 205f 5f63 745f 5f37 6f73 7472 6561 6d46 7620 5f5f 6374 5f5f 376f 7374
3770140 7265 616d 4669 205f 5f63 745f 5f37 6f73 7472 6561 6d46 6950 6320 5f5f 6374 5f5f 376f 7374 7265 616d 4652 376f 7374 7265
3770220 616d 205f 5f64 745f 5f37 6f73 7472 6561 6d46 7620 6f70 6678 5f5f 376f 7374 7265 616d 4676 206f 7366 785f 5f37 6f73 7472
3770300 6561 6d46 7620 666c 7573 685f 5f37 6f73 7472 6561 6d46 7620 5c00 7365 656b 705f 5f37 6f73 7472 6561 6d46 6c20 7365 656b
3770360 705f 5f37 6f73 7472 6561 6d46 6c38 7365 656b 5f64 6972 2074 656c 6c70 5f5f 376f 7374 7265 616d 4676 2070 7574 5f5f 376f
3770440 7374 7265 616d 4663 205f 5f6c 735f 5f37 6f73 7472 6561 6d46 6320 5f5f 6c73 5f5f 376f 7374 7265 616d 4655 6320 5f5f 6c73
3770520 5f5f 376f 7374 7265 616d 4650 4363 205f 5f6c 735f 5f37 6f73 7472 6561 6d46 6920 5f5f 6c73 5f5f 376f 7374 7265 616d 466c
3770600 205f 5f6c 735f 5f37 6f73 7472 6561 6d46 6420 5f5f 6c73 5f5f 376f 7374 7265 616d 4666 205c 005f 5f6c 735f 5f37 6f73 7472
3770660 6561 6d46 5569 205f 5f6c 735f 5f37 6f73 7472 6561 6d46 556c 205f 5f6c 735f 5f37 6f73 7472 6561 6d46 5076 205f 5f6c 735f
3770740 5f37 6f73 7472 6561 6d46 5039 7374 7265 616d 6275 6620 5f5f 6c73 5f5f 376f 7374 7265 616d 4673 205f 5f6c 735f 5f37 6f73
3771020 7472 6561 6d46 5573 205f 5f6c 735f 5f37 6f73 7472 6561 6d46 5046 5237 6f73 7472 6561 6d5f 5237 6f73 7472 6561 6d20 5f5f
3771100 6c73 5f5f 376f 7374 7265 616d 4650 4652 3369 6f73 5f52 3369 6f73 2077 7269 7465 5f5f 376f 7374 7265 616d 4650 4363 6920
3771160 5c00 7772 6974 655f 5f37 6f73 7472 6561 6d46 5043 5563 6920 646f 5f6f 7066 785f 5f37 6f73 7472 6561 6d46 7620 646f 5f6f
3771240 7366 785f 5f37 6f73 7472 6561 6d46 7620 3b3b 3b00 7075 745f 5f37 6f73 7472 6561 6d46 633a 6628 302c 3336 293d 2a28 302c
3771320 3239 2900 5f5f 3074 6869 733a 7028 302c 3336 2900 5f5f 3063 3a70 2830 2c32 2900 2f75 7372 2f43 432f 7375 6e34 2f69 6e63
3771400 6c2f 696f 7374 7265 616d 2e68 005f 5f30 7468 6973 3a72 2830 2c33 3629 005f 5f30 7468 6973 203a 5a74 6c00 5f5f 3063 203a
3771460 5a74 6c00 7075 745f 5f37 6f73 7472 6561 6d46 6320 3a5a 7446 0069 6f73 7472 6561 6d3a 5428 302c 3337 293d 7338 3078 5f67
3771540 636f 756e 745f 5f37 6973 7472 6561 6d3a 2830 2c31 292c 302c 3332 3b5f 5f76 7074 725f 5f37 6973 7472 6561 6d3a 2830 2c33
```

3771620 3329 2c33 322c 3332 3b50 696f 733a 2830 2c33 3529 2c36 342c 3332 3b4f 6f73 7472 6561 6d3a 2930 2c32 3929 2c39 362c 3534
3771700 343b 3b00 696f 7374 7265 616d 3a5a 6369 6f73 7472 6561 6d3b 6973 7472 6561 6d20 6f73 7472 6561 6d20 696f 733b 5f5f 6374
3771760 5f5f 3869 6f73 7472 6561 6d46 5039 7374 7265 616d 6275 6620 5f5f 6374 5f5f 3869 6f73 7472 6561 6d46 7620 5f5f 6374 5f5f
3772040 3869 6f73 7472 6561 6d46 5238 696f 7374 7265 616d 205f 5f64 745f 5f38 696f 7374 7265 616d 4676 203b 3b3b 0063 696e 3a47
3772120 2830 2c33 3829 3178 7369 7374 7265 616d 5f77 6974 6861 7373 6967 6e3a 0063 6f75 743a 4728 302c 3339 293d 7873 6f73 7472
3772200 6561 6d5f 7769 7468 6173 7369 676e 3a00 6365 7272 3a47 2830 2c33 3929 0063 6c6f 673a 4728 302c 3339 2900 496f 7374 7265
3772260 616d 5f69 6e69 743a 5428 302c 3430 293d 7331 5f5f 5739 5f5f 3133 496f 7374 7265 616d 5f69 6e69 743a 2830 2c32 292c 302c
3772340 383b 3b00 7374 6473 7461 7475 735f 5f31 3349 6f73 7472 6561 6d5f 696e 6974 3a47 2830 2c31 2900 696e 6974 636f 756e 745f
3772420 5f31 3349 6f73 7472 6561 6d5f 696e 6974 3a47 2830 2c31 2900 496f 7374 7265 616d 5f69 6e69 743a 5a63 496f 7374 7265 616d
3772500 5f69 6e69 743b 3b5f 5f63 745f 5f31 3349 6f73 7472 6561 6d5f 696e 6974 4676 205f 5f64 745f 5f31 3349 6f73 7472 6561 6d5f
3772560 696e 6974 4676 203b 7374 6473 7461 7475 735f 5f31 3349 6f73 7472 6561 6d5f 696e 6974 2069 6e69 7463 6f75 6e74 5f5f 3133
3772640 496f 7374 7265 616d 5f69 6e69 7420 3b40 696f 733b 0069 6f73 7472 6561 6d5f 696e 6974 3a53 2830 2c34 3029 0047 5054 3a74
3772720 2830 2c31 3329 0073 6d61 6e69 705f 696e 743a 5428 302c 3431 293d 7338 6663 745f 5f31 3073 6d61 6e69 705f 696e 743a 2830
3773000 2c34 3229 3d2a 2830 2c34 3329 3d66 2830 2c33 3529 2c30 2c33 323b 6172 675f 5f31 3073 6d61 6e69 705f 696e 743a 2830 2c31
3773060 292c 3332 2c33 323b 3b00 736d 616e 6970 5f69 6e74 3a5a 6373 6d61 6e69 705f 696e 743b 3b5f 5f63 745f 5f31 3073 6d61 6e69
3773140 705f 696e 7446 5046 5233 696f 7369 5f52 3369 6f73 6920 3b3b 5f5f 6c73 5f5f 4652 376f 7374 7265 616d 5231 3073 6d61 6e69
3773220 705f 696e 7420 5f5f 7273 5f5f 4652 3769 7374 7265 616d 5231 3073 6d61 6e69 705f 696e 7420 3b00 7361 7070 6c79 5f69 6e74
3773300 3a54 2830 2c34 3429 3d73 3466 6374 5f5f 3130 7361 7070 6c79 5f69 6e74 3a28 302c 3432 292c 302c 3332 3b3b 0073 6170 706c
3773360 795f 696e 743a 5a63 7361 7070 6c79 5f69 6e74 3b3b 5f5f 6374 5f5f 3130 7361 7070 6c79 5f69 6e74 4650 4652 3369 6f73 695f
3773440 5233 696f 7320 5f5f 636c 5f5f 3130 7361 7070 6c79 5f69 6e74 4669 203b 3b3b 0069 6d61 6e69 705f 696e 743a 5428 302c 3435
3773520 293d 7339 6663 745f 5f31 3069 6d61 6e69 705f 696e 743a 2830 2c34 3629 3d2a 2830 2c34 3729 3d66 2830 2c34 3829 3d2a 2830
3773600 2c33 3429 2c30 2c33 323b 6172 675f 5f31 3069 6161 6e69 705f 696e 743a 2830 2c31 292c 3332 2c33 323b 3b00 696d 616e 6970
3773660 5f69 6e74 3a5a 6369 6d61 6e69 705f 696e 743b 3b5f 5f63 745f 5f31 3069 6d61 6e69 705f 696e 7446 5046 5237 6973 7472 6561
3773740 6d69 5f52 3769 7374 7265 616d 6920 3b3b 5f5f 7273 5f5f 4652 3769 7374 7265 616d 5231 3069 6d61 6e69 705f 696e 7420 3b00
3774020 6961 7070 6c79 5f69 6e74 3a54 2830 2c34 3929 3d73 3466 6374 5f5f 3130 6961 7070 6c79 5f69 6e74 3a28 302c 3436 292c 302c
3774100 3332 3b3b 0069 6170 706c 795f 696e 743a 5a63 6961 7070 6c79 5f69 6e74 3b3b 5f5f 6374 5f5f 3130 6961 7070 6c79 5f69 6e74
3774160 4650 4652 3769 7374 7265 616d 695f 5237 6973 7472 6561 6d20 5f5f 636c 5f5f 3130 6961 7070 6c79 5f69 6e74 4669 203b 3b3b
3774240 006f 6d61 6e69 705f 696e 743a 5428 302c 3530 293d 7338 6663 745f 5f31 306f 6d61 6e69 705f 696e 743a 2830 2c35 3129 3d2a
3774320 2830 2c35 3229 3166 2830 2c33 3629 2c30 2c33 323b 6172 675f 5f31 306f 6d61 6e69 705f 696e 743a 2830 2c31 292c 3332 2c33
3774400 323b 3b00 6f6d 616e 6970 5f69 6e74 3a5a 636f 6d61 6e69 705f 696e 743b 3b5f 5f63 745f 5f31 306f 6d61 6e69 705f 696e 7446
3774460 5046 5237 6f73 7472 6561 6d69 5f52 376f 7374 7265 616d 6920 3b3b 5f5f 6c73 5f5f 4652 376f 7374 7265 616d 5231 306f 6d61
3774540 6e69 705f 696e 7420 3b00 6f61 7070 6c79 5f69 6e74 3a54 2830 2c35 3329 3d73 3466 6374 5f5f 3130 6f61 7070 6c79 5f69 6e74
3774620 3a28 302c 3531 292c 302c 3332 3b3b 006f 6170 706c 795f 696e 743a 5a63 6f61 7070 6c79 5f69 6e74 3b3b 5f5f 6374 5f5f 3130
3774700 6f61 7070 6c79 5f69 6e74 4650 4652 376f 7374 7265 616d 695f 5237 6f73 7472 6561 6d20 5f5f 636c 5f5f 3130 6f61 7070 6c79
3774760 5f69 6e74 4669 203b 3b3b 0069 6f6d 616e 6970 5f69 6e74 3a54 2830 2c35 3429 3d73 3866 6374 5f5f 3131 696f 6d61 6e69 705f
3775040 696e 743a 2830 2c35 3529 3d2a 2830 2c35 3629 3d66 2830 2c35 3729 3d2a 2830 2c33 3729 2c30 2c33 323b 6172 675f 5f31 3169
3775120 6f6d 616e 6970 5f69 6e74 3a28 302c 3129 2c33 322c 3332 3b3b 0069 6f6d 616e 6970 5f69 6e74 3a5a 6369 6f6d 616e 6970 5f69
3775200 6e74 3b3b 5f5f 6374 5f5f 3131 696f 6d61 6e69 705f 696e 7446 5046 5238 696f 7374 7265 616d 695f 5238 696f 7374 7265 616d
3775260 6920 3b3b 5f5f 6c73 5f5f 4652 3869 6f73 7472 6561 6d52 3131 696f 6d61 6e69 705f 696e 7420 5f5f 7273 5f5f 4652 3869 6f73
3775340 7472 6561 6d52 3131 696f 6d61 6e69 705f 696e 7420 3b00 696f 6170 706c 795f 696e 743a 5428 302c 3538 293d 7334 6663 745f
3775420 5f31 3169 6f61 7070 6c79 5f69 6e74 3a28 302c 3535 292c 302c 3332 3b3b 0069 6f61 7070 6c79 5f69 6e74 3a5a 6369 6f61 7070
3775500 6c79 5f69 6e74 3b3b 5f5f 6374 5f5f 3131 696f 6170 706c 795f 696e 7446 5046 5238 696f 7374 7265 616d 695f 5238 696f 7374
3775560 7265 616d 205f 5f63 6c5f 5f31 3169 6f61 7070 6c79 5f69 6e74 4669 203b 3b3b 0073 6d61 6e69 705f 6c6f 6e67 3a54 2830 2c35
3775640 3929 3d73 3866 6374 5f5f 3131 736d 616e 6970 5f6c 6f6e 673a 2830 2c34 3229 2c30 2c33 323b 6172 675f 5f31 3173 6d61 6e69
3775720 705f 6c6f 6e67 3a28 302c 3129 2c33 322c 3332 3b3b 0073 6d61 6e69 705f 6c6f 6e67 3a5a 6373 6d61 6e69 705f 6c6f 6e67 3b3b
3776000 5f5f 6374 5f5f 3131 736d 616e 6970 5f6c 6f6e 6746 5046 5233 696f 736c 5f52 3369 6f73 6c20 3b3b 5f5f 6c73 5f5f 4652 376f
3776060 7374 7265 616d 5231 3173 6d61 6e69 705f 6c6f 6e67 205f 5f72 735f 5f46 5237 6973 7472 6561 6d52 3131 736d 616e 6970 5f6c
3776140 6f6e 6720 3b00 7361 7070 6c79 5f6c 6f6e 673a 5428 302c 3630 293d 7334 6663 745f 5f31 3173 6170 706c 795f 6c6f 6e67 3a28
3776220 302c 3432 292c 302c 3332 3b3b 0073 6170 706c 795f 6c6f 6e67 3a5a 6373 6170 706c 795f 6c6f 6e67 3b3b 5f5f 6374 5f5f 3131
3776300 7361 7070 6c79 5f6c 6f6e 6746 5046 5233 696f 736c 5f52 3369 6f73 205f 5f63 6c5f 5f31 3173 6170 706c 795f 6c6f 6e67 466c
3776360 203b 3b3b 0069 6d61 6e69 705f 6c6f 6e67 3a54 2830 2c36 3129 3d73 3866 6374 5f5f 3131 696d 616e 6970 5f6c 6f6e 673a 2830
3776440 2c34 3629 2c30 2c33 323b 6172 675f 5f31 3169 6d61 6e69 705f 6c6f 6e67 3a28 302c 3129 2c33 322c 3332 3b3b 0069 6d61 6e69
3776520 705f 6c6f 6e67 3a5a 6369 6d61 6e69 705f 6c6f 6e67 3b3b 5f5f 6374 5f5f 3131 696d 616e 6970 5f6c 6f6e 6746 5046 5237 6973
3776600 7472 6561 6d6c 5f52 3769 7374 7265 616d 6c20 3b3b 5f5f 7273 5f5f 4652 3769 7374 7265 616d 5231 3169 6d61 6e69 705f 6c6f
3776660 6e67 203b 0069 6170 706c 795f 6c6f 6e67 3a54 2830 2c36 3229 3d73 3466 6374 5f5f 3131 6961 7070 6c79 5f6c 6f6e 673a 2830

| | | | | | | | | | | | | | | | | | | | | | | | | |
|---|---|---|---|---|---|---|---|---|---|---|---|---|---|---|---|---|---|---|---|---|---|---|---|---|
| 3776740 | 2c34 | 3629 | 2c30 | 2c33 | 323b | 3b00 | 6961 | 7070 | 6c79 | 5f6c | 6f6e | 673a | 5a63 | 6961 | 7070 | 6c79 | 5f6c | 6f6e | 673b | 3b5f | 5f63 | 745f | 5f31 | 3169 |
| 3777020 | 6170 | 706c | 795f | 6c6f | 6e67 | 4650 | 4652 | 3769 | 7374 | 7265 | 616d | 6c5f | 5237 | 6973 | 7472 | 6561 | 6d20 | 5f5f | 636c | 5f5f | 3131 | 6961 | 7070 | 6c79 |
| 3777100 | 5f6c | 6f6e | 6746 | 6c20 | 3b3b | 3b00 | 6f6d | 616e | 6970 | 5f6c | 6f6e | 673a | 5428 | 302c | 3633 | 293d | 7338 | 6663 | 745f | 5f31 | 316f | 6d61 | 6e69 | 705f |
| 3777160 | 6c6f | 6e67 | 3a28 | 302c | 3531 | 292c | 302c | 3332 | 3b61 | 7267 | 5f5f | 3131 | 6f6d | 616e | 6970 | 5f6c | 6f6e | 673a | 2830 | 2c31 | 292c | 3332 | 2c33 | 323b |
| 3777240 | 3b00 | 6f6d | 616e | 6970 | 5f6c | 6f6e | 673a | 5a63 | 6f61 | 616e | 6970 | 5f6c | 6f6e | 673b | 3b5f | 5f63 | 745f | 5f31 | 316f | 6d61 | 6e69 | 705f | 6c6f | 6e67 |
| 3777320 | 4650 | 4652 | 376f | 7374 | 7265 | 616d | 6c5f | 5237 | 6f73 | 7472 | 6561 | 6d6c | 203b | 3b5f | 5f6c | 735f | 5f46 | 5237 | 6f73 | 7472 | 6561 | 6d52 | 3131 | 6f6d |
| 3777400 | 616e | 6970 | 5f6c | 6f6e | 6720 | 3b00 | 6f61 | 7070 | 6c79 | 5f6c | 6f6e | 673a | 5428 | 302c | 3634 | 293d | 7334 | 6663 | 745f | 5f31 | 316f | 6170 | 706c | 795f |
| 3777460 | 6c6f | 6e67 | 3a28 | 302c | 3531 | 292c | 302c | 3332 | 3b3b | 006f | 6170 | 706c | 795f | 6c6f | 6e67 | 3a5a | 636f | 6170 | 706c | 795f | 6c6f | 6e67 | 3b3b | 5f5f |
| 3777540 | 6374 | 5f5f | 3131 | 6f61 | 7070 | 6c79 | 5f6c | 6f6e | 6746 | 5046 | 5237 | 6f73 | 7472 | 6561 | 6d6c | 5f52 | 376f | 7374 | 7265 | 616d | 205f | 5f63 | 6c5f | 5f31 |
| 3777620 | 316f | 6170 | 706c | 795f | 6c6f | 6e67 | 466c | 203b | 3b3b | 0069 | 6f6d | 616e | 6970 | 5f6c | 6f6e | 673a | 5428 | 302c | 3635 | 293d | 7338 | 6663 | 745f | 5f31 |
| 3777700 | 3269 | 6f6d | 616e | 6970 | 5f6c | 6f6e | 673a | 2830 | 2c35 | 3529 | 2c30 | 2c33 | 323b | 6172 | 675f | 5f31 | 3269 | 6f6d | 616e | 6970 | 5f6c | 6f6e | 673a | 2830 |
| 3777760 | 2c31 | 292c | 3332 | 2c33 | 323b | 3b00 | 696f | 6d61 | 6e69 | 705f | 6c6f | 6e67 | 3a5a | 6369 | 6f6d | 616e | 6970 | 5f6c | 6f6e | 673b | 3b5f | 5f63 | 745f | 5f31 |
| 4000040 | 3269 | 6f6d | 616e | 6970 | 5f6c | 6f6e | 6746 | 5046 | 5238 | 696f | 7374 | 7265 | 616d | 6c5f | 5238 | 696f | 7374 | 7265 | 616d | 6c20 | 3b3b | 5f5f | 6c73 | 5f5f |
| 4000120 | 4652 | 3869 | 6f73 | 7472 | 6561 | 6d52 | 3132 | 696f | 6d61 | 6e69 | 705f | 6c6f | 6e67 | 205f | 5f72 | 735f | 5f46 | 5238 | 696f | 7374 | 7265 | 616d | 5231 | 3269 |
| 4000200 | 6f6d | 616e | 6970 | 5f6c | 6f6e | 6720 | 3b00 | 696f | 6170 | 706c | 795f | 6c6f | 6e67 | 3a54 | 2830 | 2c36 | 3629 | 3d73 | 3466 | 6374 | 5f5f | 3132 | 696f | 6170 |
| 4000260 | 706c | 795f | 6c6f | 6e67 | 3a28 | 302c | 3535 | 292c | 302c | 3332 | 3b3b | 0069 | 6f61 | 7070 | 6c79 | 5f6c | 6f6e | 673a | 5a63 | 696f | 6170 | 706c | 795f | 6c6f |
| 4000340 | 6e67 | 3b3b | 5f5f | 6374 | 5f5f | 3132 | 696f | 6170 | 706c | 795f | 6c6f | 6e67 | 4650 | 4652 | 3869 | 6f73 | 7472 | 6561 | 6d6c | 5f52 | 3869 | 6f73 | 7472 | 6561 |
| 4000420 | 6d20 | 5f5f | 636c | 5f5f | 3132 | 696f | 6170 | 706c | 795f | 6c6f | 6e67 | 466c | 203b | 3b3b | 0073 | 7464 | 696f | 6275 | 663a | 5428 | 302c | 3637 | 293d | 7335 |
| 4000500 | 3261 | 6c6c | 6f63 | 5f5f | 3973 | 7472 | 6561 | 6d62 | 7566 | 3a28 | 302c | 3429 | 2c30 | 2c31 | 363b | 785f | 756e | 6275 | 665f | 5f39 | 7374 | 7265 | 616d | 6275 |
| 4000560 | 663a | 2830 | 2c34 | 292c | 3136 | 2c31 | 363b | 785f | 6261 | 7365 | 5f5f | 3973 | 7472 | 6561 | 6d62 | 7566 | 3a28 | 302c | 3230 | 292c | 3332 | 2c33 | 323b | 785f |
| 4000640 | 7062 | 6173 | 655f | 5f39 | 7374 | 7265 | 616d | 6275 | 663a | 2830 | 2c32 | 3029 | 2c36 | 342c | 3332 | 3b78 | 5f70 | 7074 | 725f | 5f39 | 7374 | 7265 | 616d | 6275 |
| 4000720 | 663a | 2830 | 2c32 | 3029 | 2c39 | 362c | 3332 | 3b78 | 5f65 | 7070 | 7472 | 5f5f | 3973 | 7472 | 6561 | 6d62 | 7566 | 3a28 | 302c | 3230 | 292c | 3132 | 382c | 3332 |
| 4001000 | 3b78 | 5f67 | 7074 | 725f | 5f39 | 7374 | 7265 | 616d | 6275 | 663a | 2830 | 2c32 | 3029 | 2c31 | 3630 | 2c33 | 323b | 785f | 6567 | 7074 | 725f | 5f39 | 7374 | 7265 |
| 4001060 | 616d | 6275 | 663a | 2830 | 2c32 | 3029 | 2c31 | 3932 | 2c33 | 323b | 5c00 | 785f | 6562 | 6163 | 6b5f | 5f39 | 7374 | 7265 | 616d | 6275 | 663a | 2830 | 2c32 | 3029 |
| 4001140 | 2c32 | 3234 | 2c33 | 323b | 785f | 626c | 656e | 5f5f | 3973 | 7472 | 6561 | 6d62 | 7566 | 3a28 | 302c | 3129 | 2c32 | 3536 | 2c33 | 323b | 5f5f | 7670 | 7472 | 5f5f |
| 4001220 | 3973 | 7472 | 6561 | 6d62 | 7566 | 3a28 | 302c | 3333 | 292c | 3238 | 382c | 3332 | 3b66 | 705f | 5f38 | 7374 | 6469 | 6f62 | 7566 | 3a28 | 302c | 3638 | 293d | 2a28 |
| 4001300 | 302c | 3138 | 293d | 7873 | 5f69 | 6f62 | 7566 | 3a2c | 3332 | 302c | 3332 | 3b6c | 6173 | 745f | 6f70 | 5f5f | 3873 | 7464 | 696f | 6275 | 663a | 2830 | 2c31 | 292c |
| 4001360 | 3335 | 322c | 3332 | 3b62 | 7566 | 5f5f | 3873 | 7464 | 696f | 6275 | 663a | 2830 | 2c36 | 3929 | 3d61 | 7228 | 302c | 3129 | 3b30 | 3b31 | 3b28 | 302c | 3229 | 2c33 |
| 4001440 | 3834 | 2c31 | 363b | 3b00 | 7374 | 6469 | 6f62 | 7566 | 3a5a | 6373 | 7464 | 696f | 6275 | 663b | 7374 | 7265 | 616d | 6275 | 663b | 6f76 | 6572 | 666c | 6f77 | 5f5f |
| 4001520 | 3873 | 7464 | 696f | 6275 | 6646 | 6920 | 756e | 6465 | 7266 | 6c6f | 775f | 5f38 | 7374 | 6469 | 6f62 | 7566 | 4676 | 2073 | 796e | 635f | 5f38 | 7374 | 6469 | 6f62 |
| 4001600 | 7566 | 4676 | 2073 | 6565 | 6b6f | 6666 | 5f5f | 3873 | 7464 | 696f | 6275 | 6646 | 6c38 | 7365 | 656b | 5f64 | 6972 | 6920 | 7062 | 6163 | 6b66 | 6169 | 6c5f | 5f38 |
| 4001660 | 7374 | 6469 | 6f62 | 7566 | 4669 | 205f | 5f63 | 745f | 5f38 | 7374 | 6469 | 6f62 | 7566 | 4650 | 365f | 696f | 6275 | 6620 | 5f5f | 6374 | 5f5f | 3873 | 7464 | 696f |
| 4001740 | 6275 | 6646 | 5243 | 3373 | 7464 | 696f | 6275 | 6620 | 5c00 | 7374 | 6469 | 6f66 | 696c | 655f | 5f38 | 7374 | 6469 | 6f62 | 7566 | 4676 | 205f | 5f64 | 745f | 5f38 |
| 4002020 | 7374 | 6469 | 6f62 | 7566 | 4676 | 203b | 3b3b | 0066 | 696c | 6562 | 7566 | 3a54 | 2830 | 2c37 | 3029 | 3d73 | 3634 | 616c | 6c6f | 635f | 5f39 | 7374 | 7265 | 616d |
| 4002100 | 6275 | 663a | 2830 | 2c34 | 292c | 302c | 3136 | 3b78 | 5f75 | 6e62 | 7566 | 5f5f | 3973 | 7472 | 6561 | 6d62 | 7566 | 3a28 | 302c | 3429 | 2c31 | 362c | 3136 | 3b78 |
| 4002160 | 5f62 | 6173 | 655f | 5f39 | 7374 | 7265 | 616d | 6275 | 663a | 2830 | 2c32 | 3029 | 2c33 | 322c | 3332 | 3b78 | 5f70 | 6261 | 7365 | 5f5f | 3973 | 7472 | 6561 | 6d62 |
| 4002240 | 7566 | 3a28 | 302c | 3230 | 292c | 3634 | 2c33 | 323b | 785f | 7070 | 7472 | 5f5f | 3973 | 7472 | 6561 | 6d62 | 7566 | 3a28 | 302c | 3230 | 292c | 3936 | 2c33 | 323b |
| 4002320 | 785f | 6570 | 7074 | 725f | 5f39 | 7374 | 7265 | 616d | 6275 | 663a | 2830 | 2c32 | 3029 | 2c31 | 3238 | 2c33 | 323b | 785f | 6770 | 7472 | 5f5f | 3973 | 7472 | 6561 |
| 4002400 | 6d62 | 7566 | 3a28 | 302c | 3230 | 292c | 3136 | 302c | 3332 | 3b78 | 5f65 | 6770 | 7472 | 5f5f | 3973 | 7472 | 6561 | 6d62 | 7566 | 3a28 | 302c | 3230 | 292c | 3139 |
| 4002460 | 322c | 3332 | 3b5c | 0078 | 5f65 | 6261 | 636b | 5f5f | 3973 | 7472 | 6561 | 6162 | 7566 | 3a28 | 302c | 3230 | 292c | 3232 | 342c | 3332 | 3b78 | 5f62 | 6c65 | 6e5f |
| 4002540 | 5f39 | 7374 | 7265 | 616d | 6275 | 663a | 2830 | 2c31 | 292c | 3235 | 362c | 3332 | 3b5f | 5f76 | 7074 | 725f | 5f39 | 7374 | 7265 | 616d | 6275 | 663a | 2830 | 2c33 |
| 4002620 | 3329 | 2c32 | 3838 | 2c33 | 323b | 7866 | 645f | 5f37 | 6669 | 6c65 | 6275 | 663a | 2830 | 2c31 | 292c | 3332 | 302c | 3332 | 3b6d | 6f64 | 655f | 5f37 | 6669 | 6c65 |
| 4002700 | 6275 | 663a | 2830 | 2c31 | 292c | 3335 | 322c | 3332 | 3b6f | 7065 | 6e65 | 645f | 5f37 | 6669 | 6c65 | 6275 | 663a | 2830 | 2c32 | 292c | 3338 | 342c | 383b | 6c61 |
| 4002760 | 7374 | 5f73 | 6565 | 6b5f | 5f37 | 6669 | 6c65 | 6275 | 663a | 2830 | 2c31 | 292c | 3431 | 362c | 3332 | 3b69 | 6e5f | 7374 | 6172 | 745f | 5f37 | 6669 | 6c65 | 6275 |
| 4003040 | 663a | 2830 | 2c32 | 3029 | 2c34 | 3438 | 2c33 | 323b | 6c61 | 6865 | 6164 | 5f5f | 3766 | 696c | 6562 | 7566 | 3a28 | 302c | 3639 | 292c | 3438 | 302c | 3136 | 3b3b |
| 4003120 | 006f | 7065 | 6e70 | 726f | 745f | 5f37 | 6669 | 6c65 | 6275 | 663a | 4728 | 302c | 3129 | 0066 | 696c | 6562 | 7566 | 3a5a | 6366 | 696c | 6562 | 7566 | 3b73 | 7472 |
| 4003200 | 6561 | 6d62 | 7566 | 3b5f | 5f63 | 745f | 5f37 | 6669 | 6c65 | 6275 | 6646 | 7620 | 5f5f | 6374 | 5f5f | 3766 | 696c | 6562 | 7566 | 4669 | 205f | 5f63 | 745f | 5f37 |
| 4003260 | 6669 | 6c65 | 6275 | 6646 | 6950 | 6354 | 3120 | 5f5f | 6374 | 5f5f | 3766 | 696c | 6562 | 7566 | 4652 | 4337 | 6669 | 6c65 | 6275 | 6620 | 6973 | 5f6f | 7065 | 6e5f |
| 4003340 | 5f37 | 6669 | 6c65 | 6275 | 6646 | 7620 | 6664 | 5f5f | 3766 | 696c | 6562 | 7566 | 4676 | 206f | 7065 | 6e5f | 5f37 | 6669 | 6c65 | 6275 | 6646 | 5043 | 6369 | 5432 |
| 4003420 | 2061 | 7474 | 6163 | 685f | 5f37 | 6669 | 6c65 | 6275 | 6646 | 6920 | 636c | 6f73 | 655f | 5f37 | 6669 | 6c65 | 6275 | 6646 | 7620 | 5c00 | 5f5f | 6474 | 5f5f | 3766 |
| 4003500 | 696c | 6562 | 7566 | 4676 | 206f | 7665 | 7266 | 6c6f | 775f | 5f37 | 6669 | 6c65 | 6275 | 6646 | 6920 | 756e | 6465 | 7266 | 6c6f | 775f | 5f37 | 6669 | 6c65 | 6275 |
| 4003560 | 6646 | 7620 | 7379 | 6e63 | 5f5f | 3766 | 696c | 6562 | 7566 | 4676 | 2073 | 6565 | 6b6f | 6666 | 5f5f | 3766 | 696c | 6562 | 7566 | 466c | 3873 | 6565 | 6b5f | 6469 |
| 4003640 | 7269 | 2073 | 6574 | 6275 | 665f | 5f37 | 6669 | 6c65 | 6275 | 6646 | 5063 | 6920 | 6c61 | 7374 | 5f6f | 705f | 5f37 | 6669 | 6c65 | 6275 | 6646 | 7620 | 3b6f | 7065 |
| 4003720 | 6e70 | 726f | 745f | 5f37 | 6669 | 6c65 | 6275 | 6620 | 3b3b | 0066 | 7374 | 7265 | 616d | 6261 | 7365 | 3a54 | 2830 | 2c37 | 3129 | 3d73 | 3133 | 3262 | 7566 | 5f5f |
| 4004000 | 3131 | 6673 | 7472 | 6561 | 6d62 | 6173 | 653a | 2830 | 2c37 | 3029 | 2c30 | 2c35 | 3132 | 3b5f | 5f76 | 7074 | 725f | 5f31 | 3166 | 7374 | 7265 | 616d | 6261 | 7365 |

```
4004060 3a28 302c 3333 292c 3531 322c 3332 3b50 696f 733a 2830 2c33 3529 2c35 3434 2c33 323b 4f69 6f73 3a28 302c 3236 292c 3537
4004140 362c 3438 303b 3b00 6673 7472 6561 6d62 6173 653a 5a53 6673 7472 6561 6d62 6173 653b 696f 733b 5f5f 6374 5f5f 3131 6673
4004220 7472 6561 6d62 6173 6546 7620 5f5f 6374 5f5f 3131 6673 7472 6561 6d62 6173 6546 5043 6369 5432 205f 5f63 745f 5f31 3166
4004300 7374 7265 616d 6261 7365 4669 205f 5f63 745f 5f31 3166 7374 7265 616d 6261 7365 4669 5063 5431 205f 5f63 745f 5f31 3166
4004360 7374 7265 616d 6261 7365 4652 3131 6673 7472 6561 6d62 6173 6520 5f5f 6474 5f5f 3131 6673 7472 6561 6d62 6173 6546 7620
4004440 6f70 656e 5f5f 3131 6673 7472 6561 6d62 6173 6546 5043 6369 5432 205c 0061 7474 6163 685f 5f31 3166 7374 7265 616d 6261
4004520 7365 4669 2063 6c6f 7365 5f5f 3131 6673 7472 6561 6d62 6173 6546 7620 7365 7462 7566 5f5f 3131 6673 7472 6561 6d62 6173
4004600 6546 5063 6920 7264 6275 665f 5f31 3166 7374 7265 616d 6261 7365 4676 2076 6572 6966 795f 5f31 3166 7374 7265 616d 6261
4004660 7365 4669 203b 3b3b 0073 7461 7465 5f76 616c 7565 3a74 2830 2c32 3129 0056 616c 7565 5f54 7970 653a 5428 302c 3732 293d
4004740 6555 4e4b 4e4f 574e 563a 302c 5354 5249 4e47 3a31 2c49 4e54 4547 4552 3a32 2c46 4c4f 4154 3a33 2c3b 0042 6c6f 636b 5f54
4005020 7970 653a 5428 302c 3733 293d 6555 4e4b 4e4f 574e 423a 302c 454e 5449 5459 3a31 2c46 554e 4354 494f 4e3a 322c 5052 4f43
4005100 4544 5552 453a 332c 3b00 456e 7469 7479 5f54 7970 653a 5428 302c 3734 293d 6555 4e4b 4e4f 574e 453a 302c 4152 4348 4954
4005160 4543 5455 5245 3a31 2c53 5542 5052 4f47 5241 413a 322c 3b00 5069 6e5f 5479 7065 3a54 2830 2c37 3529 3d65 554e 4b4e 4f57
4005240 4e50 3a30 2c49 4e50 494e 3a31 2c4f 5554 5049 4e3a 322c 494e 4f55 5450 494e 3a33 2c3b 0050 6172 615f 436c 6173 733a 5428
4005320 302c 3736 293d 6555 4e4b 4e4f 574e 433a 302c 464f 524d 414c 3a31 2c41 4354 5541 4c3a 322c 5245 534f 4c56 4544 3a33 2c3b
4005400 0042 4f4f 4c45 414e 3a54 2830 2c37 3729 3d65 4661 6c73 653a 302c 5472 7565 3a31 2c3b 0042 6f5f 6c65 616e 3a54 2830 2c37
4005460 3829 3d65 6661 6c73 653a 302c 7472 7565 3a31 2c3b 0042 7566 6665 723a 4728 302c 3230 2900 4f62 6a65 6374 3a54 2830 2c37
4005540 3929 3d73 345f 5f76 7074 725f 5f36 4f62 6a65 6374 3a28 302c 3333 292c 302c 3332 3b3b 004f 626a 6563 743a 5a63 4f62 6a65
4005620 6374 3b3b 5f5f 6374 5f5f 364f 626a 6563 7446 7620 5f5f 6374 5f5f 364f 626a 6563 7446 5243 364f 626a 6563 7420 6572 726f
4005700 724d 656d 6f72 795f 5f36 4f62 6a65 6374 4650 6354 3120 6578 706c 6169 6e5f 5f36 4f62 6a65 6374 4650 6320 696e 4f72 6465
4005760 725f 5f36 4f62 6a65 6374 4650 364f 626a 6563 7420 3b3b 3b00 5f5f 7074 626c 5f5f 364f 626a 6563 745f 5f44 4963 7265 6d65
4006040 6e74 6f72 5f63 7878 3a47 2830 2c33 3329 0050 463a 7428 302c 3135 2900 5046 433a 7428 302c 3135 2900 5046 493a 7428 302c
4006120 3135 2900 4e4f 626a 6563 743a 5428 302c 3830 293d 7338 5f5f 7670 7472 5f5f 364f 626a 6563 743a 2830 2c33 3329 2c30 2c33
4006200 323b 6e61 6d65 5f5f 374e 4f62 6a65 6374 3a28 302c 3230 292c 3332 2c33 323b 3b00 4e4f 626a 6563 743a 5a63 4e4f 626a 6563
4006260 743b 4f62 6a65 6374 3b5f 5f63 745f 5f37 4e4f 626a 6563 7446 5063 205f 5f63 745f 5f37 4e4f 626a 6563 7446 5243 374e 4f62
4006340 6a65 6374 2073 6574 4e61 6d65 5f5f 374e 4f62 6a65 6374 4650 6320 6765 744e 616d 655f 5f37 4e4f 626a 6563 7446 7620 6578
4006420 706c 6169 6e5f 5f37 4e4f 626a 6563 7446 5063 2067 6574 4174 7472 5f5f 374e 4f62 6a65 6374 4669 2067 6574 5072 6f70 5f5f
4006500 374e 4f62 6a65 6374 4650 6369 2073 6574 5072 6f70 5f5f 374e 4f62 6a65 6374 4650 6354 3120 5c00 7365 7450 726f 705f 5f37
4006560 4e4f 626a 6563 7446 5063 6920 7365 7450 726f 705f 5f37 4e4f 626a 6563 7446 5063 6620 6973 4754 455f 5f37 4e4f 626a 6563
4006640 7446 5036 4f62 6a65 6374 2069 734c 5445 5f5f 374e 4f62 6a65 6374 4650 364f 626a 6563 7420 3b3b 3b00 6f73 7472 6561 6d5f
4006720 7769 7468 6173 7369 676e 3a54 2830 2c33 3929 3d73 3638 5f5f 7670 7472 5f5f 376f 7374 7265 616d 3a28 302c 3333 292c 302c
4007000 3332 3b50 696f 733a 2830 2c33 3529 2c33 322c 3332 3b4f 696f 733a 2830 2c32 3629 2c36 342c 3438 303b 3b00 6f73 7472 6561
4007060 6d5f 7769 7468 6173 7369 676e 3a5a 636f 7374 7265 616d 5f77 6974 6861 7373 6967 6e3b 6f73 7472 6561 6d20 696f 733b 5f5f
4007140 6374 5f5f 3138 6f73 7472 6561 6d5f 7769 7468 6173 7369 676e 4676 205f 5f63 745f 5f31 386f 7374 7265 616d 5f77 6974 6861
4007220 7373 6967 6e46 5231 386f 7374 7265 616d 5f77 6974 6861 7373 6967 6e20 5f5f 6474 5f5f 3138 6f73 7472 6561 6d5f 7769 7468
4007300 6173 7369 676e 4676 205f 5f61 735f 5f31 386f 7374 7265 616d 5f77 6974 6861 7373 6967 6e46 5237 6f73 7472 6561 6d20 5c00
4007360 5f5f 6173 5f5f 3138 6f73 7472 6561 6d5f 7769 7468 6173 7369 676e 4650 3973 7472 6561 6d62 7566 203b 3b3b 0050 4642 3a74
4007440 2830 2c31 3529 004c 4e4f 626a 6563 743a 5428 302c 3831 293d 7331 325f 5f76 7074 725f 5f36 4f62 6a65 6374 3a28 302c 3333
4007520 292c 302c 3332 3b6e 616d 655f 5f37 4e4f 626a 6563 743a 2830 2c32 3029 2c33 322c 3332 3b6e 6578 745f 5f38 4c4e 4f62 6a65
4007600 6374 3a28 302c 3832 293d 2a28 302c 3831 292c 3634 2c33 323b 3b00 4c4e 4f62 6a65 6374 3a5a 634c 4e4f 626a 6563 743b 4e4f
4007660 626a 6563 743b 5f5f 6374 5f5f 384c 4e4f 626a 6563 7446 5063 5038 4c4e 4f62 6a65 6374 205f 5f63 745f 5f38 4c4e 4f62 6a65
4007740 6374 4652 4338 4c4e 4f62 6a65 6374 2073 6574 4e65 7874 5f5f 384c 4e4f 626a 6563 7446 5038 4c4e 4f62 6a65 6374 2067 6574
4010020 4e65 7874 5f5f 384c 4e4f 626a 6563 7446 7620 3b3b 3b00 4c4f 626a 6563 743a 5428 302c 3833 293d 7338 5f5f 7670 7472 5f5f
4010100 364f 626a 6563 743a 2830 2c33 3329 2c30 2c33 323b 6e65 7874 5f5f 374c 4f62 6a65 6374 3a28 302c 3834 293d 2a28 302c 3833
4010160 292c 3332 2c33 323b 3b00 4c4f 626a 6563 743a 5a63 4c4f 626a 6563 743b 4f62 6a65 6374 3b5f 5f63 745f 5f37 4c4f 626a 6563
4010240 7446 5037 4c4f 626a 6563 7420 5f5f 6374 5f5f 374c 4f62 6a65 6374 4652 4337 4c4f 626a 6563 7420 7365 744e 6578 745f 5f37
4010320 4c4f 626a 6563 7446 5037 4c4f 626a 6563 7420 6765 744e 6578 745f 5f37 4c4f 626a 6563 7446 7620 3b3b 3b00 4c50 4f62 6a65
4010400 6374 3a54 2830 2c38 3529 3d73 3132 5f5f 7670 7472 5f5f 364f 626a 6563 743a 2830 2c33 3329 2c30 2c33 323b 6e65 7874 5f5f
4010460 374c 4f62 6a65 6374 3a28 302c 3834 292c 3332 2c33 323b 6e6f 626a 7074 725f 5f38 4c50 4f62 6a65 6374 3a28 302c 3836 293d
4010540 2a28 302c 3830 292c 3634 2c33 323b 3b00 4c50 4f62 6a65 6374 3a5a 634c 504f 626a 6563 743b 4c4f 626a 6563 743b 5f5f 6374
4010620 5f5f 384c 504f 626a 6563 7446 5037 4e4f 626a 6563 7450 374c 4f62 6a65 6374 205f 5f63 745f 5f38 4c50 4f62 6a65 6374 4652
4010700 4338 4c50 4f62 6a65 6374 2073 6574 4f62 6a65 6374 5f5f 384c 504f 626a 6563 7446 5037 4e4f 626a 6563 7420 6765 744f 626a
4010760 6563 745f 5f38 4c50 4f62 6a65 6374 4676 2065 7870 6c61 696e 5f5f 384c 504f 626a 6563 7446 5063 203b 3b3b 005f 5f70 7462
4011040 6c5f 5f38 4c50 4f62 6a65 6374 5f5f 4449 6372 656d 656e 746f 725f 6378 783a 4728 302c 3333 2900 4c69 7374 3a54 2830 2c38
4011120 3729 3d73 3132 636f 756e 745f 5f34 4c69 7374 3a28 302c 3129 2c30 2c33 323b 7074 724c 4f62 6a65 6374 5f5f 344c 6973 743a
```

| | | | | | | | | | | | | | | | | | | | | | | | | |
|---|---|---|---|---|---|---|---|---|---|---|---|---|---|---|---|---|---|---|---|---|---|---|---|---|
| 4011200 | 2430 | 2c38 | 3429 | 2c33 | 322c | 3332 | 3b5f | 5f76 | 7074 | 725f | 5f34 | 4c69 | 7374 | 3a28 | 302c | 3333 | 292c | 3634 | 2c33 | 323b | 3b00 | 4c69 | 7374 | 3a5a |
| 4011260 | 634c | 6973 | 743b | 3b5f | 5f63 | 745f | 5f34 | 4c69 | 7374 | 4676 | 205f | 5f63 | 745f | 5f34 | 4c69 | 7374 | 4652 | 4334 | 4c69 | 7374 | 205f | 5f64 | 745f | 5f34 |
| 4011340 | 4c69 | 7374 | 4676 | 2067 | 6574 | 436f | 756e | 745f | 5f34 | 4c69 | 7374 | 4676 | 2067 | 6574 | 546f | 705f | 5f34 | 4c69 | 7374 | 4676 | 2073 | 6574 | 546f | 705f |
| 4011420 | 5f34 | 4c69 | 7374 | 4650 | 374c | 4f62 | 6a65 | 6374 | 2065 | 7272 | 6f72 | 4d65 | 6d6f | 7279 | 5f5f | 344c | 6973 | 7446 | 5063 | 5431 | 2062 | 726f | 6164 | 6361 |
| 4011500 | 7374 | 5f5f | 344c | 6973 | 7446 | 4d36 | 4f62 | 6a65 | 6374 | 4676 | 5f76 | 2065 | 7870 | 6c61 | 696e | 5f5f | 344c | 6973 | 7446 | 5063 | 205c | 0069 | 6e73 | 6572 |
| 4011560 | 745f | 5f34 | 4c69 | 7374 | 4650 | 374c | 4f62 | 6a65 | 6374 | 2069 | 734d | 656d | 6265 | 725f | 5f34 | 4c69 | 7374 | 4650 | 374c | 4f62 | 6a65 | 6374 | 2069 | 734d |
| 4011640 | 656d | 6265 | 725f | 5f34 | 4c69 | 7374 | 4650 | 6320 | 6973 | 4571 | 7561 | 6c5f | 5f34 | 4c69 | 7374 | 4652 | 344c | 6973 | 7420 | 7265 | 6d6f | 7665 | 5f5f | 344c |
| 4011720 | 6973 | 7446 | 5063 | 203b | 3b3b | 005f | 5f70 | 7462 | 6c5f | 5f34 | 4c69 | 7374 | 5f5f | 4449 | 6372 | 656d | 656e | 746f | 725f | 6378 | 783a | 4728 | 302c | 3333 |
| 4012000 | 2900 | 504c | 6973 | 743a | 5428 | 302c | 3838 | 293d | 7331 | 3263 | 6f75 | 6e74 | 5f5f | 344c | 6973 | 743a | 2830 | 2c31 | 292c | 302c | 3332 | 3b70 | 7472 | 4c4f |
| 4012060 | 626a | 6563 | 745f | 5f34 | 4c69 | 7374 | 3a28 | 302c | 3834 | 292c | 3332 | 2c33 | 323b | 5f5f | 7670 | 7472 | 5f5f | 344c | 6973 | 743a | 2830 | 2c33 | 3329 | 2c36 |
| 4012140 | 342c | 3332 | 3b3b | 0050 | 4c69 | 7374 | 3a5a | 6350 | 4c69 | 7374 | 3b4c | 6973 | 743b | 696e | 7365 | 7274 | 5f5f | 3550 | 4c69 | 7374 | 4650 | 384c | 504f | 626a |
| 4012220 | 6563 | 7420 | 696e | 7365 | 7274 | 5f5f | 3550 | 4c69 | 7374 | 4652 | 3550 | 4c69 | 7374 | 2053 | 6f72 | 745f | 504c | 6973 | 745f | 5f35 | 504c | 6973 | 7446 | 6920 |
| 4012300 | 7265 | 7665 | 7273 | 655f | 5f35 | 504c | 6973 | 7446 | 7620 | 696e | 7365 | 7274 | 4166 | 7465 | 725f | 5f35 | 504c | 6973 | 7446 | 5038 | 4c50 | 4f62 | 6a65 | 6374 |
| 4012360 | 5431 | 2072 | 656d | 6f76 | 655f | 5f35 | 504c | 6973 | 7446 | 5038 | 4c50 | 4f62 | 6a65 | 6374 | 2072 | 656d | 6f76 | 655f | 5f35 | 504c | 6973 | 7446 | 5063 | 2069 |
| 4012440 | 734d | 656d | 6265 | 725f | 5f35 | 504c | 6973 | 7446 | 5063 | 205c | 0069 | 734d | 656d | 6265 | 725f | 5f35 | 504c | 6973 | 7446 | 5037 | 4c4f | 626a | 6563 | 7420 |
| 4012520 | 6973 | 4571 | 7561 | 6c5f | 5f35 | 504c | 6973 | 7446 | 5234 | 4c69 | 7374 | 2065 | 7870 | 6c61 | 696e | 5f5f | 3550 | 4c69 | 7374 | 4650 | 6320 | 5f5f | 6374 | 5f5f |
| 4012600 | 3550 | 4c69 | 7374 | 4652 | 4335 | 504c | 6973 | 7420 | 5f5f | 6374 | 5f5f | 3550 | 4c69 | 7374 | 4676 | 203b | 3b3b | 005f | 5f70 | 7462 | 6c5f | 5f35 | 504c | 6973 |
| 4012660 | 745f | 5f44 | 4963 | 7265 | 6d65 | 6e74 | 6f72 | 5f63 | 7878 | 3a47 | 2830 | 2c33 | 3329 | 004c | 6973 | 7449 | 7465 | 7261 | 746f | 723a | 5428 | 302c | 3839 | 293d |
| 4012740 | 7338 | 6c69 | 7374 | 5f5f | 3132 | 4c69 | 7374 | 4974 | 6572 | 6174 | 6f72 | 3a28 | 302c | 3930 | 293d | 2a28 | 302c | 3837 | 292c | 302c | 3332 | 3b70 | 5f5f | 3132 |
| 4013020 | 4c69 | 7374 | 4974 | 6572 | 6174 | 6f72 | 3a28 | 302c | 3834 | 292c | 3332 | 2c33 | 323b | 3b00 | 4c69 | 7374 | 4974 | 6572 | 6174 | 6f72 | 3a5a | 634c | 6973 | 7449 |
| 4013100 | 7465 | 7261 | 746f | 723b | 3b5f | 5f63 | 745f | 5f31 | 324c | 6973 | 7449 | 7465 | 7261 | 746f | 7246 | 5234 | 4c69 | 7374 | 2072 | 6573 | 6574 | 5f5f | 3132 | 4c69 |
| 4013160 | 7374 | 4974 | 6572 | 6174 | 6f72 | 4676 | 2061 | 7474 | 6163 | 685f | 5f31 | 324c | 6973 | 7449 | 7465 | 7261 | 746f | 7246 | 5234 | 4c69 | 7374 | 2067 | 6574 | 4375 |
| 4013240 | 7272 | 656e | 745f | 5f31 | 324c | 6973 | 7449 | 7465 | 7261 | 746f | 7246 | 7620 | 5f5f | 7070 | 5f5f | 3132 | 4c69 | 7374 | 4974 | 6572 | 6174 | 6f72 | 4676 | 203b |
| 4013320 | 3b3b | 0050 | 696e | 4c65 | 6e67 | 7468 | 3a54 | 2830 | 2c39 | 3129 | 3d73 | 3136 | 5f5f | 7670 | 7472 | 5f5f | 364f | 626a | 6563 | 743a | 2830 | 2c33 | 3329 | 2c30 |
| 4013400 | 2c33 | 323b | 6e61 | 6d65 | 5f5f | 374e | 4f62 | 6a65 | 6374 | 3a28 | 302c | 3230 | 292c | 3332 | 2c33 | 323b | 436c | 656e | 6774 | 695f | 5f39 | 5069 | 6e4c | 656e |
| 4013460 | 6774 | 683a | 2830 | 2c32 | 3029 | 2c36 | 342c | 3332 | 3b49 | 6c65 | 6e67 | 7468 | 5f5f | 3950 | 696e | 4c65 | 6e67 | 7468 | 3a28 | 302c | 3129 | 2c39 | 362c | 3332 |
| 4013540 | 3b3b | 0050 | 696e | 4c65 | 6e67 | 7468 | 3a5a | 6350 | 696e | 4c65 | 6e67 | 7468 | 3b4e | 4f62 | 6a65 | 6374 | 3b5f | 5f63 | 745f | 5f39 | 5069 | 6e4c | 656e | 6774 |
| 4013620 | 6846 | 5063 | 5431 | 205f | 5f63 | 745f | 5f39 | 5069 | 6e4c | 656e | 6774 | 6846 | 5243 | 3950 | 696e | 4c65 | 6e67 | 7468 | 2073 | 6574 | 5f50 | 696e | 4c65 | 6e67 |
| 4013700 | 7468 | 5f5f | 3950 | 696e | 4c65 | 6e67 | 7468 | 4650 | 6354 | 3120 | 6765 | 745f | 495f | 5069 | 6e4c | 656e | 6774 | 685f | 5f39 | 5069 | 6e4c | 656e | 6774 | 6846 |
| 4013760 | 7620 | 6765 | 745f | 495f | 5069 | 6e4c | 656e | 6774 | 685f | 5f39 | 5069 | 6e4c | 656e | 6774 | 6846 | 6920 | 3b3b | 3b00 | 4d6f | 6447 | 656e | 3a54 | 2830 | 2c39 |
| 4014040 | 3229 | 3d73 | 3234 | 4269 | 7457 | 6964 | 7468 | 5f5f | 3641 | 6f64 | 4765 | 6e3a | 2830 | 2c31 | 292c | 302c | 3332 | 3b45 | 5374 | 6174 | 655f | 5f36 | 4d6f | 6447 |
| 4014120 | 656e | 3a28 | 302c | 3738 | 292c | 3332 | 2c33 | 323b | 5069 | 6e4e | 616d | 654c | 656e | 6774 | 685f | 5f36 | 4d6f | 6447 | 656e | 3a28 | 302c | 3838 | 292c | 3634 |
| 4014200 | 2c39 | 363b | 5f5f | 7670 | 7472 | 5f5f | 364d | 6f64 | 4765 | 6e3a | 2830 | 2c33 | 3329 | 2c31 | 3630 | 2c33 | 323b | 3b00 | 4d6f | 6447 | 656e | 3a5a | 634d | 6f64 |
| 4014260 | 4765 | 6e3b | 3b5f | 5f63 | 745f | 5f36 | 4d6f | 6447 | 656e | 4676 | 205f | 5f63 | 745f | 5f36 | 4d6f | 6447 | 656e | 4652 | 4336 | 4d6f | 6447 | 656e | 2073 | 6574 |
| 4014340 | 5f42 | 6974 | 5769 | 6474 | 685f | 5f36 | 4d6f | 6447 | 656e | 4669 | 2073 | 6574 | 5f45 | 5374 | 6174 | 655f | 5f36 | 4d6f | 6447 | 656e | 4637 | 426f | 6f6c | 6561 |
| 4014420 | 6e20 | 6765 | 745f | 4553 | 7461 | 7465 | 5f5f | 364d | 6f64 | 4765 | 6e46 | 7620 | 7365 | 745f | 5069 | 6e4c | 656e | 6774 | 685f | 5f36 | 4d6f | 6447 | 656e | 4650 |
| 4014500 | 6354 | 3120 | 6765 | 745f | 5069 | 6e4c | 656e | 6774 | 685f | 5f36 | 4d6f | 6447 | 656e | 4650 | 6320 | 7365 | 7449 | 6e64 | 6578 | 5f5f | 364d | 6f64 | 4765 | 6e46 |
| 4014560 | 7620 | 5c00 | 7365 | 744e | 616d | 6549 | 6e64 | 6578 | 5f5f | 364d | 6f64 | 4765 | 6e46 | 5063 | 204c | 6f61 | 645f | 5648 | 444c | 5f44 | 6174 | 615f | 5f36 | 4d6f |
| 4014640 | 6447 | 656e | 4650 | 374e | 4f62 | 6a65 | 6374 | 2043 | 6f64 | 706f | 7365 | 5f44 | 6f64 | 4765 | 6e5f | 4465 | 7363 | 7269 | 7074 | 6f72 | 5f5f | 364d | 6f64 | 4765 |
| 4014720 | 6e46 | 5063 | 2065 | 7870 | 6c61 | 696e | 5f5f | 364d | 6f64 | 4765 | 6e46 | 7620 | 5f5f | 6474 | 5f5f | 364d | 6f64 | 4765 | 6e46 | 7620 | 3b3b | 3b00 | 5f5f | 7074 |
| 4015000 | 626c | 5f5f | 364d | 6f64 | 4765 | 6e5f | 5f44 | 4963 | 7265 | 6d65 | 6e74 | 6f72 | 5f63 | 7879 | 3a47 | 2830 | 2c33 | 3329 | 0049 | 4f5f | 4d61 | 6e61 | 6765 | 723a |
| 4015060 | 5428 | 302c | 3933 | 293d | 7333 | 3669 | 6670 | 5f5f | 3130 | 494f | 5f4d | 616e | 6167 | 6572 | 3a28 | 302c | 3638 | 292c | 302c | 3332 | 3b6f | 6670 | 5f5f | 3130 |
| 4015140 | 494f | 5f4d | 616e | 6167 | 6572 | 3a28 | 302c | 3638 | 292c | 3332 | 2c33 | 323b | 6d66 | 705f | 5f31 | 3049 | 4f5f | 4d61 | 6e61 | 6765 | 723a | 2830 | 2c36 | 3829 |
| 4015220 | 2c36 | 342c | 3332 | 3b63 | 6670 | 5f5f | 3130 | 494f | 5f4d | 616e | 6167 | 6572 | 3a28 | 302c | 3638 | 292c | 3936 | 2c33 | 323b | 4946 | 696c | 654e | 616d | 655f |
| 4015300 | 5f31 | 3049 | 4f5f | 4d61 | 6e61 | 6765 | 723a | 2830 | 2c32 | 3029 | 2c31 | 3238 | 2c33 | 323b | 4f46 | 696c | 654e | 616d | 655f | 5f31 | 3049 | 4f5f | 4d61 | 6e61 |
| 4015360 | 6765 | 723a | 2830 | 2c32 | 3029 | 2c31 | 3630 | 2c33 | 323b | 4d46 | 696c | 654e | 616d | 655f | 5f31 | 3049 | 4f5f | 4d61 | 6e61 | 6765 | 723a | 2830 | 2c32 | 3029 |
| 4015440 | 2c31 | 3932 | 2c33 | 323b | 4346 | 696c | 654e | 616d | 655f | 5f31 | 3049 | 4f5f | 4d61 | 6e61 | 6765 | 723a | 2830 | 2c32 | 3029 | 2c32 | 3234 | 2c33 | 323b | 6375 |
| 4015520 | 4c69 | 6e65 | 5f5f | 3130 | 494f | 5f4d | 616e | 6167 | 6572 | 3a28 | 302c | 3129 | 2c32 | 3536 | 2c33 | 323b | 3b00 | 494f | 5f4d | 616e | 6167 | 6572 | 3a5a | 6349 |
| 4015600 | 4f5f | 4d61 | 6e61 | 6765 | 723b | 3b5f | 5f63 | 745f | 5f31 | 3049 | 4f5f | 4d61 | 6e61 | 6765 | 7246 | 5063 | 205f | 5f64 | 745f | 5f31 | 3049 | 4f5f | 4d61 | 6e61 |
| 4015660 | 6765 | 7246 | 7620 | 494f | 4368 | 6563 | 6b5f | 5f31 | 3049 | 4f5f | 4d61 | 6e61 | 6765 | 7246 | 7620 | 436f | 7079 | 4669 | 6c65 | 546f | 4c69 | 6e65 | 5f5f | 3130 |
| 4015740 | 494f | 5f4d | 616e | 6167 | 6572 | 4669 | 2043 | 6f70 | 7946 | 696c | 6554 | 6f45 | 6e64 | 5f5f | 3130 | 494f | 5f4d | 616e | 6167 | 6572 | 4676 | 2053 | 7461 | 746d |
| 4016020 | 656e | 7448 | 616e | 6465 | 6c65 | 725f | 5f31 | 3049 | 4f5f | 4d61 | 6e61 | 6765 | 7246 | 5063 | 5431 | 6920 | 5c00 | 436f | 7079 | 4669 | 6c65 | 546f | 4b65 | 7957 |
| 4016100 | 5f5f | 3130 | 494f | 5f4d | 616e | 6167 | 6572 | 4650 | 6354 | 3120 | 4561 | 745f | 5374 | 6174 | 656d | 656e | 745f | 5f31 | 3049 | 4f5f | 4d61 | 6e61 | 6765 | 7246 |
| 4016160 | 5063 | 5431 | 2057 | 5f4f | 7574 | 4669 | 6c65 | 5f5f | 3130 | 494f | 5f4d | 616e | 6167 | 6572 | 4650 | 6320 | 575f | 4d46 | 696c | 655f | 5f31 | 3049 | 4f5f | 4d61 |
| 4016240 | 6e61 | 6765 | 7246 | 5063 | 2057 | 5f43 | 4669 | 6c65 | 5f5f | 3130 | 494f | 5f4d | 616e | 6167 | 6572 | 4650 | 6320 | 3b3b | 3b00 | 5f5f | 4335 | 353a | 5428 | 302c |

| | | | | | | | | | | | | | | | | | | | | | | | | |
|---|---|---|---|---|---|---|---|---|---|---|---|---|---|---|---|---|---|---|---|---|---|---|---|---|
| 4016320 | 3934 | 293d | 7534 | 7376 | 616c | 7565 | 3a28 | 302c | 3230 | 292c | 302c | 3332 | 3b69 | 7661 | 6c75 | 653a | 2830 | 2c31 | 292c | 302c | 3332 | 3b66 | 7661 | 6c75 |
| 4016400 | 653a | 2830 | 2c39 | 292c | 302c | 3332 | 3b3b | 005f | 5f43 | 3535 | 3a5a | 635f | 5f43 | 3535 | 3b3b | 3b3b | 3b00 | 4765 | 6e56 | 616c | 7565 | 3a54 | 2830 | 2c39 |
| 4016460 | 3529 | 3d73 | 3136 | 5f5f | 7670 | 7472 | 5f5f | 364f | 626a | 6563 | 743a | 2830 | 2c33 | 3329 | 2c30 | 2c33 | 323b | 6e61 | 6d65 | 5f5f | 374e | 4f62 | 6a65 | 6374 |
| 4016540 | 3a28 | 302c | 3230 | 292c | 3332 | 2c33 | 323b | 7479 | 7065 | 5f5f | 3847 | 656e | 5661 | 6c75 | 653a | 2830 | 2c37 | 3229 | 2c36 | 342c | 3332 | 3b5f | 5f4f | 3535 |
| 4016620 | 5f5f | 3847 | 656e | 5661 | 6c75 | 653a | 2830 | 2c39 | 3429 | 2c39 | 362c | 3332 | 3b3b | 0047 | 656e | 5661 | 6c75 | 653a | 5a63 | 4765 | 6e56 | 616c | 7565 | 3b4e |
| 4016700 | 4f62 | 6a65 | 6374 | 3b5f | 5f63 | 745f | 5f38 | 4765 | 6e56 | 616c | 7565 | 4676 | 205f | 5f63 | 745f | 5f38 | 4765 | 6e56 | 616c | 7565 | 4652 | 4338 | 4765 | 6e56 |
| 4016760 | 616c | 7565 | 205f | 5f64 | 745f | 5f38 | 4765 | 6e56 | 616c | 7565 | 4676 | 2073 | 6574 | 5f47 | 656e | 5661 | 6c75 | 655f | 7479 | 7065 | 5f5f | 3847 | 656e | 5661 |
| 4017040 | 6c75 | 6546 | 5063 | 6920 | 7365 | 745f | 4765 | 6e56 | 616c | 7565 | 5f74 | 7970 | 655f | 5f38 | 4765 | 6e56 | 616c | 7565 | 4631 | 3056 | 616c | 7565 | 5f54 | 7970 |
| 4017120 | 6520 | 7365 | 745f | 4765 | 6e56 | 616c | 7565 | 5f5f | 3847 | 656e | 5661 | 6c75 | 6546 | 5063 | 205c | 0073 | 6574 | 5f47 | 656e | 5661 | 6c75 | 655f | 5f38 | 4765 |
| 4017200 | 6e56 | 616c | 7565 | 4669 | 2073 | 6574 | 5f47 | 656e | 5661 | 6c75 | 655f | 5f38 | 4765 | 6e56 | 616c | 7565 | 4666 | 2067 | 6574 | 5f47 | 656e | 5661 | 6c75 | 655f |
| 4017260 | 7479 | 7065 | 5f5f | 3847 | 656e | 5661 | 6c75 | 6546 | 7620 | 6765 | 745f | 4765 | 6e56 | 616c | 7565 | 5f73 | 5f5f | 3847 | 656e | 5661 | 6c75 | 6546 | 7620 | 6765 |
| 4017340 | 745f | 4765 | 6e56 | 616c | 7565 | 5f69 | 5f5f | 3847 | 656e | 5661 | 6c75 | 6546 | 7620 | 6765 | 745f | 4765 | 6e56 | 616c | 7565 | 5f66 | 5f5f | 3847 | 656e | 5661 |
| 4017420 | 6c75 | 6546 | 7620 | 6578 | 706c | 6169 | 6e5f | 5f38 | 4765 | 6e56 | 616c | 7565 | 4650 | 6320 | 5c00 | 6368 | 6563 | 6b5f | 5f38 | 4765 | 6e56 | 616c | 7565 | 4669 |
| 4017500 | 203b | 3b3b | 005f | 5f70 | 7462 | 6c5f | 5f38 | 4765 | 6e56 | 616c | 7565 | 5f5f | 4449 | 6372 | 656d | 656e | 746f | 725f | 6378 | 783a | 4728 | 302c | 3333 | 2900 |
| 4017560 | 7061 | 7261 | 6d65 | 7465 | 723a | 5428 | 302c | 3336 | 293d | 7336 | 305f | 5f76 | 7074 | 725f | 5f36 | 4f62 | 6a65 | 6374 | 3a28 | 302c | 3333 | 292c | 302c | 3332 |
| 4017640 | 3b6e | 616d | 655f | 5f37 | 4e4f | 626a | 6563 | 743a | 2830 | 2c32 | 3029 | 2c33 | 322c | 3332 | 3b6e | 616d | 655f | 5f39 | 7061 | 7261 | 6d65 | 7465 | 723a | 2830 |
| 4017720 | 2c32 | 3029 | 2c36 | 342c | 3332 | 3b74 | 7970 | 655f | 5f39 | 7061 | 7261 | 6d65 | 7465 | 723a | 2830 | 2c32 | 3029 | 2c39 | 362c | 3332 | 3b72 | 616e | 6765 | 5f5f |
| 4020000 | 3370 | 6172 | 616d | 6574 | 6572 | 3a28 | 302c | 3230 | 292c | 3132 | 382c | 3332 | 3b73 | 6c69 | 6365 | 5f5f | 3970 | 6172 | 616d | 6574 | 6572 | 3a28 | 302c | 3230 |
| 4020060 | 292c | 3136 | 302c | 3332 | 3b53 | 6c6f | 775f | 5f39 | 7061 | 7261 | 6d65 | 7465 | 723a | 2830 | 2c31 | 292c | 3139 | 322c | 3332 | 3b53 | 6869 | 6768 | 5f5f | 3970 |
| 4020140 | 6172 | 616d | 6574 | 6572 | 3a28 | 302c | 3129 | 2c32 | 3234 | 2c33 | 323b | 5c00 | 5043 | 6c61 | 7373 | 5f5f | 3970 | 6172 | 616d | 6574 | 6572 | 3a28 | 302c | 3736 |
| 4020220 | 292c | 3235 | 362c | 3332 | 3b50 | 5852 | 6566 | 5f5f | 3970 | 6172 | 616d | 6574 | 6572 | 3a28 | 302c | 3937 | 293d | 2a28 | 302c | 3936 | 292c | 3238 | 382c | 3332 |
| 4020300 | 3b6d | 6f64 | 655f | 5f39 | 7061 | 7261 | 6d65 | 7465 | 723a | 2830 | 2c37 | 3529 | 2c33 | 3230 | 2c33 | 323b | 7661 | 6c75 | 655f | 5f39 | 7061 | 7261 | 6d65 | 7465 |
| 4020360 | 723a | 2830 | 2c39 | 3529 | 2c33 | 3532 | 2c31 | 3238 | 3b3b | 0070 | 6172 | 616d | 6574 | 6572 | 3a5a | 6370 | 6172 | 616d | 6574 | 6572 | 3b4e | 4f62 | 6a65 | 6374 |
| 4020440 | 3b5f | 5f63 | 745f | 5f39 | 7061 | 7261 | 6d65 | 7465 | 7246 | 7620 | 5f5f | 6374 | 5f5f | 3970 | 6172 | 616d | 6574 | 6572 | 4652 | 4339 | 7061 | 7261 | 6d65 | 7465 |
| 4020520 | 7220 | 5f5f | 6474 | 5f5f | 3970 | 6172 | 616d | 6574 | 6572 | 4676 | 2067 | 6574 | 5f70 | 6172 | 616d | 6574 | 6572 | 5f6d | 6f64 | 655f | 5f39 | 7061 | 7261 | 6d65 |
| 4020600 | 7465 | 7246 | 7620 | 6765 | 745f | 7061 | 7261 | 6d65 | 7465 | 725f | 636c | 6173 | 735f | 5f39 | 7061 | 7261 | 6d65 | 7465 | 7246 | 7620 | 6765 | 745f | 7061 | 7261 |
| 4020660 | 5f73 | 6c6f | 775f | 5f39 | 7061 | 7261 | 6d65 | 7465 | 7246 | 7620 | 5c00 | 6765 | 745f | 7061 | 7261 | 5f73 | 6869 | 6768 | 5f5f | 3970 | 6172 | 616d | 6574 | 6572 |
| 4020740 | 4676 | 2067 | 6574 | 5f70 | 6172 | 616d | 6574 | 6572 | 5f72 | 616e | 6765 | 5f5f | 3970 | 6172 | 616d | 6574 | 6572 | 4676 | 2067 | 6574 | 5f70 | 6172 | 616d | 6574 |
| 4021020 | 6572 | 5f74 | 7970 | 655f | 5f39 | 7061 | 7261 | 6d65 | 7465 | 7246 | 7620 | 6765 | 745f | 7061 | 7261 | 6d65 | 7465 | 725f | 6e61 | 6d65 | 5f5f | 3970 | 6172 | 616d |
| 4021100 | 6574 | 6572 | 4676 | 2067 | 6574 | 5f70 | 6172 | 616d | 6574 | 6572 | 5f73 | 6c69 | 6365 | 5f5f | 3970 | 6172 | 616d | 6574 | 6572 | 4676 | 2067 | 6574 | 5f70 | 6172 |
| 4021160 | 616d | 6574 | 6572 | 5f50 | 5852 | 4546 | 5f5f | 3970 | 6172 | 616d | 6574 | 6572 | 4631 | 3050 | 6172 | 615f | 436c | 6173 | 7320 | 5c00 | 6765 | 745f | 636f | 7272 |
| 4021240 | 6563 | 745f | 6c65 | 6e67 | 7468 | 5f5f | 3970 | 6172 | 616d | 6574 | 6572 | 4676 | 2067 | 6574 | 5f70 | 6172 | 615f | 6c65 | 6e67 | 7468 | 5f5f | 3970 | 6172 | 616d |
| 4021320 | 6574 | 6572 | 4676 | 2067 | 6574 | 5f70 | 6172 | 615f | 7374 | 6174 | 7573 | 5f5f | 3970 | 6172 | 616d | 6574 | 6572 | 4676 | 2067 | 6574 | 5f70 | 6172 | 616d | 6574 |
| 4021400 | 6572 | 5f76 | 616c | 7565 | 5f5f | 3970 | 6172 | 616d | 6574 | 6572 | 4676 | 2067 | 6574 | 5f70 | 6172 | 616d | 6574 | 6572 | 5f76 | 616c | 7565 | 5f74 | 7970 | 655f |
| 4021460 | 5f39 | 7061 | 7261 | 6365 | 7465 | 7246 | 7620 | 6765 | 745f | 7061 | 7261 | 6d65 | 7465 | 725f | 7376 | 616c | 7565 | 5f5f | 3970 | 6172 | 616d | 6574 | 6572 | 4676 |
| 4021540 | 205c | 0067 | 6574 | 5f70 | 6172 | 616d | 6574 | 6572 | 5f69 | 7661 | 6c75 | 655f | 5f39 | 7061 | 7261 | 6d65 | 7465 | 7246 | 7620 | 6765 | 745f | 7061 | 7261 | 6d65 |
| 4021620 | 7465 | 725f | 6676 | 616c | 7565 | 5f5f | 3970 | 6172 | 616d | 6574 | 6572 | 4676 | 2073 | 6574 | 5f70 | 6172 | 616d | 6574 | 6572 | 5f6e | 616d | 655f | 5f39 | 7061 |
| 4021700 | 7261 | 6d65 | 7465 | 7246 | 5063 | 2073 | 6574 | 5f70 | 6172 | 616d | 6574 | 6572 | 5f63 | 6c61 | 7373 | 5f5f | 3970 | 6172 | 616d | 6574 | 6572 | 4631 | 3050 | 6172 |
| 4021760 | 615f | 436c | 6173 | 7320 | 7365 | 745f | 7061 | 7261 | 6d65 | 7465 | 725f | 7479 | 7065 | 5f5f | 3970 | 6172 | 616d | 6574 | 6572 | 4650 | 6320 | 7365 | 745f | 7061 |
| 4022040 | 7261 | 6d65 | 7465 | 725f | 736c | 6963 | 655f | 5f39 | 7061 | 7261 | 6d65 | 7465 | 7246 | 5063 | 205c | 0073 | 6574 | 5f70 | 6172 | 616d | 6574 | 6572 | 5f73 | 7261 |
| 4022120 | 6e67 | 655f | 5f39 | 7061 | 7261 | 6d65 | 7465 | 7246 | 5063 | 2073 | 6574 | 5f70 | 6172 | 616d | 6574 | 6572 | 5f50 | 5852 | 6566 | 5f5f | 3970 | 6172 | 616d | 6574 |
| 4022200 | 6572 | 4650 | 6359 | 3562 | 6c6f | 636b | 2073 | 6574 | 5f70 | 6172 | 616d | 6574 | 6572 | 5f72 | 616e | 6765 | 5f5f | 3970 | 6172 | 616d | 6574 | 6572 | 4650 | 6320 |
| 4022260 | 7365 | 745f | 7061 | 7261 | 6d65 | 7465 | 725f | 636f | 6465 | 5f5f | 3970 | 6172 | 616d | 6574 | 6572 | 4650 | 6320 | 7365 | 745f | 7061 | 7261 | 6d65 | 7465 | 725f |
| 4022340 | 7661 | 6c75 | 655f | 5f39 | 7061 | 7261 | 6d65 | 7465 | 7246 | 5063 | 2073 | 6574 | 5f70 | 6172 | 616d | 6574 | 6572 | 5f76 | 616c | 7565 | 5f5f | 3970 | 6172 | 616d |
| 4022420 | 6574 | 6572 | 4669 | 205c | 0073 | 6574 | 5f70 | 6172 | 616d | 6574 | 6572 | 5f76 | 616c | 7565 | 5f5f | 3970 | 6172 | 616d | 6574 | 6572 | 4666 | 2073 | 6574 | 5f70 |
| 4022500 | 6172 | 616d | 6574 | 6572 | 5f76 | 616c | 7565 | 5f74 | 7970 | 655f | 5f39 | 7061 | 7261 | 6d65 | 7465 | 7246 | 5063 | 2067 | 6574 | 5f56 | 4844 | 4c5f | 466f | 726d |
| 4022560 | 616c | 5f50 | 6172 | 616d | 5f5f | 3970 | 6172 | 616d | 6574 | 6572 | 4650 | 6369 | 2067 | 6574 | 5f56 | 4844 | 4c5f | 5072 | 6d74 | 725f | 5f39 | 7061 | 7261 | 6d65 |
| 4022640 | 7465 | 7246 | 5063 | 6920 | 6765 | 745f | 5648 | 444c | 5f45 | 7870 | 616e | 6465 | 645f | 466f | 726d | 616c | 5f50 | 6172 | 616d | 5f5f | 3970 | 6172 | 616d | 6574 |
| 4022720 | 6572 | 4650 | 3562 | 6c6f | 636b | 5063 | 6920 | 5c00 | 6765 | 745f | 5648 | 444c | 5f45 | 7870 | 616e | 6465 | 645f | 5072 | 6d74 | 725f | 4d61 | 705f | 5f39 | 7061 |
| 4023000 | 7261 | 6d65 | 7465 | 7246 | 5035 | 626c | 6f63 | 6b50 | 6369 | 2065 | 7870 | 6c61 | 696e | 5f5f | 3970 | 6172 | 616d | 6574 | 6572 | 4650 | 6320 | 3b3b | 3b00 | 5f5f |
| 4023060 | 7074 | 626c | 5f5f | 3970 | 6172 | 616d | 6574 | 6572 | 5f5f | 4449 | 6372 | 656d | 656e | 746f | 725f | 6378 | 783a | 4728 | 302c | 3333 | 2900 | 626c | 6f63 | 6b5f |
| 4023140 | 6174 | 7472 | 6962 | 7574 | 6573 | 3a54 | 2830 | 2c39 | 3829 | 3173 | 3238 | 5f5f | 7670 | 7472 | 5f5f | 364f | 626a | 6563 | 743a | 2830 | 2c33 | 3329 | 2c30 | 2c33 |
| 4023220 | 323b | 6e61 | 6d65 | 5f5f | 374e | 4f62 | 6a65 | 6374 | 3a28 | 302c | 3230 | 292c | 3332 | 2c33 | 323b | 6e61 | 6d65 | 5f5f | 3136 | 626c | 6f63 | 6b5f | 6174 | 7472 |
| 4023300 | 6962 | 7574 | 6573 | 3a28 | 302c | 3230 | 292c | 3634 | 2c33 | 323b | 7661 | 6c75 | 655f | 5f31 | 3662 | 6c6f | 636b | 5f61 | 7474 | 7269 | 6275 | 7465 | 733a | 2830 |
| 4023360 | 2c39 | 3529 | 2c39 | 362c | 3132 | 383b | 3b00 | 626c | 6f63 | 6b5f | 6174 | 7472 | 6962 | 7574 | 6573 | 3a5a | 6362 | 6c6f | 636b | 5f61 | 7474 | 7269 | 6275 | 7465 |

```
4023440  733b 4e4f 626a 6563 743b 5f5f 6374 5f5f 3136 626c 6f63 6b5f 6174 7472 6962 7574 6573 4650 6320 5f5f 6374 5f5f 3136 626c
4023520  6f63 6b5f 6174 7472 6962 7574 6573 4676 205f 5f63 745f 5f31 3662 6c6f 636b 5f61 7474 7269 6275 7465 7346 5243 3136 626c
4023600  6f63 6b5f 6174 7472 6962 7574 6573 205f 5f64 745f 5f31 3662 6c6f 636b 5f61 7474 7269 6275 7465 7346 7620 7365 745f 6174
4023660  7472 6962 7574 655f 6e61 6d65 5f5f 3136 626c 6f63 6b5f 6174 7472 6962 7574 6573 4650 6320 5c00 7365 745f 6174 7472 6962
4023740  7574 655f 7661 6c75 655f 5f31 3662 6c6f 636b 5f61 7474 7269 6275 7465 7346 5063 2073 6574 5f61 7474 7269 6275 7465 5f76
4024020  616c 7565 5f5f 3136 626c 6f63 6b5f 6174 7472 6962 7574 6573 4669 2073 6574 5f61 7474 7269 6275 7465 5f76 616c 7565 5f5f
4024100  3136 626c 6f63 6b5f 6174 7472 6962 7574 6573 4666 2073 6574 5f61 7474 7269 6275 7465 5f74 7970 655f 5f31 3662 6c6f 636b
4024160  5f61 7474 7269 6275 7465 7346 5063 2067 6574 5f61 7474 7269 6275 7465 5f6e 616d 655f 5f31 3662 6c6f 636b 5f61 7474 7269
4024240  6275 7465 7346 7620 5c00 6765 745f 6174 7472 6962 7574 655f 7479 7065 5f5f 3136 626c 6f63 6b5f 6174 7472 6962 7574 6573
4024320  4676 2067 6574 5f61 7474 7269 6275 7465 5f73 7661 6c75 655f 5f31 3662 6c6f 636b 5f61 7474 7269 6275 7465 7346 7620 6765
4024400  745f 6174 7472 6962 7574 655f 6976 616c 7565 5f5f 3136 626c 6f63 6b5f 6174 7472 6962 7574 6573 4676 2067 6574 5f61 7474
4024460  7269 6275 7465 5f66 7661 6c75 655f 5f31 3662 6c6f 636b 5f61 7474 7269 6275 7465 7346 7620 6765 745f 6174 7472 6962 7574
4024540  655f 7661 6c75 655f 5f31 3662 6c6f 636b 5f61 7474 7269 6275 7465 7346 7620 5c00 6578 706c 6169 6e5f 5f31 3662 6c6f 636b
4024620  5f61 7474 7269 6275 7465 7346 5063 203b 3b3b 005f 5f70 7462 6c5f 5f31 3662 6c6f 636b 5f61 7474 7269 6275 7465 735f 5f44
4024700  4963 7265 6d65 6e74 6f72 5f63 7878 3a47 2830 2c33 3329 0065 6e74 6974 793a 5428 302c 3939 293d 7336 305f 5f76 7074 725f
4024760  5f36 4f62 6a65 6374 3a28 302c 3333 292c 302c 3332 3b6e 616d 655f 5f37 4e4f 626a 6563 743a 2830 2c32 3029 2c33 322c 3332
4025040  3b6e 616d 655f 5f36 656e 7469 7479 3a28 302c 3230 292c 3634 2c33 323b 4669 6c65 4e61 6d65 5f5f 3665 6e74 6974 793a 2830
4025120  2c32 3029 2c39 362c 3332 3b61 7263 686e 616d 655f 5f36 656e 7469 7479 3a28 302c 3230 292c 3132 382c 3332 3b74 7970 655f
4025200  5f36 656e 7469 7479 3a28 302c 3129 2c31 3630 2c33 323b 6172 6368 5f6c 696e 655f 5f36 656e 7469 7479 3a28 302c 3129 2c31
4025260  3932 2c33 323b 6361 6c6c 5f6c 696e 655f 5f36 656e 7469 7479 3a28 302c 3129 2c32 3234 2c33 323b 5c00 7072 6373 5f6c 696e
4025340  655f 5f36 656e 7469 7479 3a28 302c 3129 2c32 3536 2c33 323b 7175 616c 6966 6965 645f 5f36 656e 7469 7479 3a28 302c 3838
4025420  292c 3238 382c 3936 3b73 7562 5f62 6c6f 636b 735f 5f36 656e 7469 7479 3a28 302c 3838 292c 3338 342c 3936 3b3b 0065 6e74
4025500  6974 793a 5a63 656e 7469 7479 3b4e 4f62 6a65 6374 3b5f 5f63 745f 5f36 656e 7469 7479 4676 205f 5f63 745f 5f36 656e 7469
4025560  7479 4652 4336 656e 7469 7479 205f 5f64 745f 5f36 656e 7469 7479 4676 2073 6574 5f65 6e74 6974 795f 6e61 6d65 5f5f 3665
4025640  6e74 6974 7946 5063 2073 6574 5f65 6e74 6974 795f 6669 6c65 5f5f 3665 6e74 6974 7946 5063 2073 6574 5f65 6e74 6974 795f
4025720  6172 6368 6e61 6165 5f5f 3665 6e74 6974 7946 5063 2073 6574 5f65 6e74 6974 795f 7479 7065 5f5f 3665 6e74 6974 7946 5063
4026000  205c 0073 6574 5f61 7263 685f 6c69 6e65 5f5f 3665 6e74 6974 7946 6920 7365 745f 6361 6c6c 5f6c 696e 655f 5f36 656e 7469
4026060  7479 4669 2073 6574 5f70 7263 735f 6c69 6e65 5f5f 3665 6e74 6974 7946 6920 6765 745f 656e 7469 7479 5f6e 616d 655f 5f36
4026140  656e 7469 7479 4676 2067 6574 5f65 6e74 6974 795f 6172 6368 6e61 6d65 5f5f 3665 6e74 6974 7946 7620 6765 745f 656e 7469
4026220  7479 5f66 696c 655f 5f36 656e 7469 7479 4676 2067 6574 5f65 6e74 6974 795f 7479 7065 5f5f 3665 6e74 6974 7946 7620 5c00
4026300  6765 745f 6172 6368 5f6c 696e 655f 5f36 656e 7469 7479 4676 2067 6574 5f63 616c 6c5f 6c69 6e65 5f5f 3665 6e74 6974 7946
4026360  7620 6765 745f 7072 6373 5f6c 696e 655f 5f36 656e 7469 7479 4676 2069 7347 5445 5f5f 3665 6e74 6974 7946 5036 4f62 6a65
4026440  6374 2069 734c 5445 5f5f 3665 6e74 6974 7946 5036 4f62 6a65 6374 2065 7870 6c61 696e 5f5f 3665 6e74 6974 7946 5063 203b
4026520  3b3b 005f 5f70 7462 6c5f 5f36 656e 7469 7479 5f5f 4449 6372 656d 656e 746f 725f 6378 783a 4728 302c 3333 2900 626c 6f63
4026600  6b3a 5428 302c 3130 3029 3473 3134 305f 5f76 7074 725f 5f36 4f62 6a65 6374 3a28 302c 3333 292c 302c 3332 3b6e 616d 655f
4026660  5f37 4e4f 626a 6563 743a 2830 2c32 3029 2c33 322c 3332 3b6e 616d 655f 5f35 626c 6f63 6b3a 2830 2c32 3029 2c36 342c 3332
4026740  3b74 7970 655f 5f35 626c 6f63 6b3a 2830 2c31 292c 3936 2c33 323b 4d47 5f4e 616d 655f 5f35 626c 6f63 6b3a 2830 2c32 3029
4027020  2c31 3238 2c33 323b 4d47 5f54 7970 655f 5f35 626c 6f63 6b3a 2830 2c32 3029 2c31 3630 2c33 323b 4d47 5f53 7562 5479 7065
4027100  5f5f 3562 6c6f 636b 3a28 302c 3230 292c 3139 322c 3332 3b50 6172 656e 745f 5f35 626c 6f63 6b3a 2830 2c39 3929 2c32 3234
4027160  2c34 3030 3b5c 004d 4744 7363 7270 746e 5f5f 3562 6c6f 636b 3a28 302c 3130 3129 3d2a 2830 2c39 3229 2c37 3034 2c33 323b
4027240  4163 7475 616c 5f5f 3562 6c6f 636b 3a28 302c 3838 292c 3733 362c 3936 3b46 6f72 6d61 6c5f 5f35 626c 6f63 6b3a 2830 2c38
4027320  3829 2c38 3332 2c39 363b 5265 736f 6c76 6564 5f5f 3562 6c6f 636b 3a28 302c 3838 292c 3932 382c 3936 3b41 7474 7269 6275
4027400  7465 735f 5f35 626c 6f63 6b3a 2830 2c38 3829 2c31 3032 342c 3936 3b3b 0062 6c6f 636b 3a5a 6362 6c6f 636b 3b4e 4f62 6a65
4027460  6374 3b5f 5f63 745f 5f35 626c 6f63 6b46 7620 5f5f 6374 5f5f 3562 6c6f 636b 4652 4335 626c 6f63 6b20 5f5f 6474 5f5f 3562
4027540  6c6f 636b 4676 2073 6574 5f62 6c6f 636b 5f6e 616d 655f 5f35 626c 6f63 6b46 5063 2073 6574 5f62 6c6f 636b 5f74 7970 655f
4027620  5f35 626c 6f63 6b46 5063 2067 6574 5f62 6c6f 636b 5f6e 616d 655f 5f35 626c 6f63 6b46 7620 6765 745f 626c 6f63 6b5f 7479
4027700  7065 5f5f 3562 6c6f 636b 4676 2067 6574 5f62 6c6f 636b 5f70 6172 656e 745f 5f35 626c 6f63 6b46 7620 5c00 6765 745f 626c
4027760  6f63 6b5f 4d6f 6447 656e 5f5f 3562 6c6f 636b 4676 2067 6574 5f46 6f72 6d61 6c5f 5f35 626c 6f63 6b46 7620 6765 745f 4163
4030040  7475 616c 5f5f 3562 6c6f 636b 4676 2067 6574 5f52 6573 6f6c 7665 645f 5f35 626c 6f63 6b46 7620 6765 745f 4174 7472 6962
4030120  7574 655f 5f35 626c 6f63 6b46 7620 6765 745f 636f 6d70 5f6c 656e 6774 685f 5f35 626c 6f63 6b46 7620 6973 5175 616c 6966
4030200  6965 645f 5f35 626c 6f63 6b46 7620 6973 4c54 455f 5f35 626c 6f63 6b46 5036 4f62 6a65 6374 205c 0069 7347 5445 5f5f 3562
4030260  6c6f 636b 4650 364f 626a 6563 7420 6578 706c 6169 6e5f 5f35 626c 6f63 6b46 5063 2052 6576 6572 7365 416c 6c4c 6973 7473
4030340  5f5f 3562 6c6f 636b 4676 2043 6865 636b 5061 7261 4c69 7374 735f 5f35 626c 6f63 6b46 7620 4368 6563 6b50 6172 616d 4c69
4030420  7374 5f5f 3562 6c6f 636b 4650 3550 4c69 7374 2057 5f56 4844 4c5f 436f 6d70 496e 7374 5f5f 3562 6c6f 636b 4676 2057 5f56
4030500  4844 4c5f 436f 6d70 4465 635f 5f35 626c 6f63 6b46 7620 6765 745f 5648 444c 5f43 6f6d 704c 6162 6c65 5f5f 3562 6c6f 636b
```

```
4030560  4650 6320 5c00 6765 745f 5648 444c 5f43 6f6d 704e 616d 655f 5f35 626c 6f63 6b46 5063 2057 5f4d 475f 436f 6d70 4473 6372
4030640  7074 6e5f 5f35 626c 6f63 6b46 7620 575f 4d47 5f43 6865 636b 436f 6d70 5f5f 3562 6c6f 636b 4676 2057 5f43 4c5f 4172 6368
4030720  426f 6479 5f5f 3562 6c6f 636b 4676 2057 5f43 4c5f 456e 7469 7479 4465 635f 5f35 626c 6f63 6b46 7620 3b3b 3b00 5f5f 7074
4031000  626c 5f5f 3562 6c6f 636b 5f5f 4449 6372 656d 656e 746f 725f 6378 783a 4728 302c 3333 2900 5f5f 6374 5f5f 3665 6e74 6974
4031060  7946 763a 6628 302c 3130 3229 3d2a 2830 2c39 3929 005f 5f30 7468 6973 3a70 2830 2c31 3032 2900 2f68 6f6d 652f 6f73 6173
4031140  312f 612f 6162 2f73 7263 2f6e 6577 6f62 6a65 6374 732f 7072 6f67 2f68 7878 2f65 6e74 6974 792e 6878 7800 5f5f 3074 6869
4031220  733a 7228 302c 3130 3229 005f 5f30 7468 6973 203a 5a74 6c00 5f5f 6374 5f5f 3665 6e74 6974 7946 7620 3a5a 7446 0044 6573
4031300  6967 6e55 6e69 743a 5428 302c 3130 3329 3d73 3532 5f5f 7670 7472 5f5f 364f 626a 6563 743a 2830 2c33 3329 2c30 2c33 323b
4031360  6e61 6d65 5f5f 374e 4f62 6a65 6374 3a28 302c 3230 292c 3332 2c33 323b 4465 556e 4e61 6d65 5f5f 3130 4465 7369 676e 556e
4031440  6974 3a28 302c 3230 292c 3634 2c33 323b 4669 6c65 4e61 6d65 5f5f 3130 4465 7369 676e 556e 6974 3a28 302c 3230 292c 3936
4031520  2c33 323b 4172 6368 4e61 6d65 5f5f 3130 4465 7369 676e 556e 6974 3a28 302c 3230 292c 3132 382c 3332 3b44 6555 6e54 7970
4031600  655f 5f31 3044 6573 6967 6e55 6e69 743a 2830 2c31 292c 3136 302c 3332 3b41 7263 684c 696e 655f 5f31 3044 6573 6967 6e55
4031660  6e69 743a 2830 2c31 292c 3139 322c 3332 3b51 7561 6c69 6669 6564 5f5f 3130 4465 7369 676e 556e 6974 3a28 302c 3838 292c
4031740  3232 342c 3936 3b53 7562 426c 6f63 6b73 5f5f 3130 4465 7369 676e 556e 6974 3a28 302c 3838 292c 3332 302c 3936 3b3b 0044
4032020  6573 6967 6e55 6e69 743a 5a63 4465 7369 676e 556e 6974 3b4e 4f62 6a65 6374 3b5f 5f63 745f 5f31 3044 6573 6967 6e55 6e69
4032100  7446 7620 5f5f 6374 5f5f 3130 4465 7369 676e 556e 6974 4650 6320 5f5f 6374 5f5f 3130 4465 7369 676e 556e 6974 4650 3665
4032160  6e74 6974 7920 5f5f 6374 5f5f 3130 4465 7369 676e 556e 6974 4652 4331 3044 6573 6967 6e55 6e69 7420 5f5f 6474 5f5f 3130
4032240  4465 7369 676e 556e 6974 4676 2073 6574 5f44 555f 4465 556e 4e61 6d65 5f5f 3130 4465 7369 676e 556e 6974 4650 6320 5c00
4032320  7365 745f 4455 5f46 696c 654e 616d 655f 5f31 3044 6573 6967 6e55 6e69 7446 5063 2073 6574 5f44 555f 4172 6368 4e61 6d65
4032400  5f5f 3130 4465 7369 676e 556e 6974 4650 6320 7365 745f 4455 5f44 6555 6e54 7970 655f 5f31 3044 6573 6967 6e55 6e69 7446
4032460  6920 7365 745f 4455 5f41 7263 684c 696e 655f 5f31 3044 6573 6967 6e55 6e69 7446 6920 6765 745f 4455 5f46 696c 654e 616d
4032540  655f 5f31 3044 6573 6967 6e55 6e69 7446 7620 4571 7561 6c5f 5f31 3044 6573 6967 6e55 6e69 7446 5036 656e 7469 7479 205c
4032620  0069 7347 5445 5f5f 3130 4465 7369 676e 556e 6974 4650 364f 626a 6563 7420 6973 4c54 455f 5f31 3044 6573 6967 6e55 6e69
4032700  7446 5036 4f62 6a65 6374 2067 6574 5f44 555f 5175 616c 6966 6965 645f 5f31 3044 6573 6967 6e55 6e69 7446 7620 6765 745f
4032760  4455 5f53 7562 426c 6f63 6b73 5f5f 3130 4465 7369 676e 556e 6974 4676 2045 7870 616e 645f 5648 444c 5f44 555f 5f31 3044
4033040  6573 6967 6e55 6e69 7446 7620 6578 706c 6169 6e5f 5f31 3044 6573 6967 6e55 6e69 7446 5063 203b 3b3b 005f 5f70 7462 6c5f
4033120  5f31 3044 6573 6967 6e55 6e69 745f 5f44 4963 7265 6d65 6e74 6f72 5f63 7878 3a47 2830 2c33 3329 0046 696c 6555 6e69 743a
4033200  5428 302c 3130 3429 3d73 3234 5f5f 7670 7472 5f5f 364f 626a 6563 743a 2830 2c33 3329 2c30 2c33 323b 6e61 6d65 5f5f 374e
4033260  4f62 6a65 6374 3a28 302c 3230 292c 3332 2c33 323b 4669 6c65 4e61 6d65 5f5f 3846 696c 6555 6e69 743a 2830 2c32 3029 2c36
4033340  342c 3332 3b45 6e74 6974 794c 6973 745f 5f38 4669 6c65 556e 6974 3a28 302c 3838 292c 3936 2c39 363b 3b00 4669 6c65 556e
4033420  6974 3a5a 6346 696c 6555 6e69 743b 4e4f 626a 6563 743b 5f5f 6374 5f5f 3846 696c 6555 6e69 7446 7620 5f5f 6374 5f5f 3846
4033500  696c 6555 6e69 7446 5063 205f 5f63 745f 5f38 4669 6c65 556e 6974 4652 4338 4669 6c65 556e 6974 205f 5f64 745f 5f38 4669
4033560  6c65 556e 6974 4676 2073 6574 5f46 555f 4669 6c65 4e61 6d65 5f5f 3846 696c 6555 6e69 7446 5063 2067 6574 5f46 555f 4669
4033640  6c65 4e61 6d65 5f5f 3846 696c 6555 6e69 7446 7620 6765 745f 456e 7469 7479 4c69 7374 5f5f 3846 696c 6555 6e69 7446 7620
4033720  5c00 4578 7061 6e64 5f56 4844 4c5f 4455 5f5f 3846 696c 6555 6e69 7446 7620 6578 706c 6169 6e5f 5f38 4669 6c65 556e 6974
4034000  4650 6320 3b3b 3b00 5f5f 7074 626c 5f5f 3846 696c 6555 6e69 745f 5f44 4963 7265 6d65 6e74 6f72 5f63 7878 3a47 2830 2c33
4034060  3329 0041 6c6c 426c 6f63 6b73 3a54 2830 2c31 3035 293d 7334 345f 5f76 7074 725f 5f36 4f62 6a65 6374 3a28 302c 3333 292c
4034140  302c 3332 3b6e 616d 655f 5f37 4e4f 626a 6563 743a 2830 2c32 3029 2c33 322c 3332 3b42 6c6f 636b 4c69 7374 5f5f 3941 6c6c
4034220  426c 6f63 6b73 3a28 302c 3838 292c 3634 2c39 363b 4455 4c69 7374 5f5f 3941 6c6c 426c 6f63 6b73 3a28 302c 3838 292c 3136
4034300  302c 3936 3b46 554c 6973 745f 5f39 416c 6c42 6c6f 636b 733a 2830 2c38 3829 2c32 3536 2c39 363b 3b00 416c 6c42 6c6f 636b
4034360  733a 5a63 416c 6c42 6c6f 636b 733b 4e4f 626a 6563 743b 5f5f 6374 5f5f 3941 6c6c 426c 6f63 6b73 4676 205f 5f63 745f 5f39
4034440  416c 6c42 6c6f 636b 7346 5243 3941 6c6c 426c 6f63 6b73 205f 5f64 745f 5f39 416c 6c42 6c6f 636b 7346 7620 6765 745f 426c
4034520  6f63 6b4c 6973 745f 5f39 416c 6c42 6c6f 636b 7346 7620 6765 745f 4455 4c69 7374 5f5f 3941 6c6c 426c 6f63 6b73 4676 2067
4034600  6574 5f46 554c 6973 745f 5f39 416c 6c42 6c6f 636b 7346 7620 5265 6164 5f56 4844 4c5f 426c 6b46 696c 655f 5f39 416c 6c42
4034660  6c6f 636b 7346 5063 205c 0052 6576 6572 7365 5061 7261 6d4c 6973 7473 5f5f 3941 6c6c 426c 6f63 6b73 4676 206d 616b 655f
4034740  4455 4c69 7374 5f5f 3941 6c6c 426c 6f63 6b73 4676 206d 616b 655f 4655 4c69 7374 5f5f 3941 6c6c 426c 6f63 6b73 4676 2045
4035020  7870 616e 645f 5648 444c 5f46 555f 5f39 416c 6c42 6c6f 636b 7346 7620 6578 706c 6169 6e5f 5f39 416c 6c42 6c6f 636b 7346
4035100  5063 203b 3b3b 005f 5f70 7462 6c5f 5f39 416c 6c42 6c6f 636b 735f 5f44 4963 7265 6d65 6e74 6f72 5f63 7878 3a47 2830 2c33
4035160  3329 004d 475f 5370 6563 6966 6963 3a54 2830 2c31 3036 293d 7331 3274 6563 686e 6f6c 6f67 795f 5f31 314d 475f 5370 6563
4035240  6966 6963 3a28 302c 3230 292c 302c 3332 3b6c 6273 5f74 6563 684e 756d 5f5f 3131 4d47 5f53 7065 6369 6669 633a 2830 2c31
4035320  292c 3332 2c33 323b 4d65 6d5f 7465 6368 4e75 635f 5f31 314d 475f 5370 6563 6966 6963 3a28 302c 3129 2c36 342c 3332 3b3b
4035400  004d 475f 5370 6563 6966 6963 3a5a 634d 475f 5370 6563 6966 6963 3b3b 5f5f 6374 5f5f 3131 4d47 5f53 7065 6369 6669 6346
4035460  7620 5f5f 6474 5f5f 3131 4d47 5f53 7065 6369 6669 6346 7620 7365 745f 7465 6368 6e6f 6c6f 6779 5f6e 616d 655f 5f31 314d
4035540  475f 5370 6563 6966 6963 4650 6320 6765 745f 6c62 735f 7465 6368 4e75 6d5f 5f31 314d 475f 5370 6563 6966 6963 4676 2067
4035620  6574 5f4d 656d 5f74 6563 684e 756d 5f5f 3131 4d47 5f53 7065 6369 6669 6346 7620 6765 745f 7465 6368 4e61 6d65 5f5f 3131
```

```
4035700  4d47 5f53 7065 6369 6669 6346 7620 5c00 6578 706c 6169 6e5f 5f31 314d 475f 5370 6563 6966 6963 4650 6320 3b3b 3b00 4449
4035760  6372 656d 656e 746f 723a 5428 302c 3130 3729 3173 3438 4269 7457 6964 7468 5f5f 364d 6f64 4765 6e3a 2830 2c31 292c 302c
4036040  3332 3b45 5374 6174 655f 5f36 4d6f 6447 656e 3a28 302c 3738 292c 3332 2c33 323b 5069 6e4e 616d 654c 656e 6774 685f 5f36
4036120  4d6f 6447 656e 3a28 302c 3838 292c 3634 2c39 363b 5f5f 7670 7472 5f5f 364d 6f64 4765 6e3a 2830 2c33 3329 2c31 3630 2c33
4036200  323b 7479 7065 5f5f 3131 4449 6372 656d 656e 746f 723a 2830 2c32 3029 2c31 3932 2c33 323b 6d61 696e 5f6d 656e 755f 5f31
4036260  3144 4963 7265 6d65 6e74 6f72 3a28 302c 3129 2c32 3234 2c33 323b 7375 625f 6d65 6e75 5f5f 3131 4449 6372 656d 656e 746f
4036340  723a 2830 2c31 292c 3235 362c 3332 3b6d 6f64 756c 656e 6164 655f 5f31 3144 4963 7265 6d65 6e74 6f72 3a28 302c 3230 292c
4036420  3238 382c 3332 3b5c 0062 6974 735f 5f31 3144 4963 7265 6d65 6e74 6f72 3a28 302c 3129 2c33 3230 2c33 323b 6661 7374 5f5f
4036500  3131 4449 6372 656d 656e 746f 723a 2830 2c37 3829 2c33 3532 2c33 323b 3b00 4449 6372 656d 656e 746f 723a 5a63 4449 6372
4036560  656d 656e 746f 723b 4d6f 6447 656e 3b5f 5f63 745f 5f31 3144 4963 7265 6d65 6e74 6f72 4650 6320 5f5f 6374 5f5f 3131 4449
4036640  6372 656d 656e 746f 7246 7620 5f5f 6374 5f5f 3131 4449 6372 656d 656e 746f 7246 5243 3131 4449 6372 656d 656e 746f 7220
4036720  5f5f 6474 5f5f 3131 4449 6372 656d 656e 746f 7246 7620 7365 744e 616d 6549 6e64 6578 5f5f 3131 4449 6372 656d 656e 746f
4037000  7246 5063 2073 6574 496e 6465 785f 5f31 3144 4963 7265 6d65 6e74 6f72 4676 205c 004c 6f61 645f 5648 444c 5f44 6174 615f
4037060  5f31 3144 4963 7265 6d65 6e74 6f72 4650 374e 4f62 6a65 6374 2043 6f6d 706f 7365 5f4d 6f64 4765 6e5f 4465 7363 7269 7074
4037140  6f72 5f5f 3131 4449 6372 656d 656e 746f 7246 5063 203b 3b3b 005f 5f70 7462 6c5f 5f31 3144 4963 7265 6d65 6e74 6f72 5f5f
4037220  4449 6372 656d 656e 746f 725f 6378 703a 4728 302c 3333 2900 7465 6d70 4d47 3a47 2830 2c32 3029 004d 473a 4728 302c 3130
4037300  3829 3d2a 2830 2c31 3036 2900 7365 7449 6e64 6578 5f5f 3131 4449 6372 656d 656e 746f 7246 763a 4628 302c 3229 005f 5f30
4037360  7468 6973 3a70 2830 2c31 3039 293d 2a28 302c 3130 3729 0044 4963 7265 6d65 6e74 6f72 2e63 7878 005f 5f30 7468 6973 3a72
4037440  2830 2c31 3039 2900 5f5f 305f 5f58 4230 3079 6963 306c 653a 2830 2c37 3829 005f 5f30 7468 6973 203a 5a74 6c00 7365 7449
4037520  6e64 6578 5f5f 3131 4449 6372 656d 656e 746f 7246 7520 3a5a 7446 004c 6f61 645f 5648 444c 5f44 6174 615f 5f31 3144 4963
4037600  7265 6d65 6e74 6f72 4650 374e 4f62 6a65 6374 3a46 2830 2c32 2900 5f5f 3074 6869 733a 7028 302c 3130 3929 005f 5f30 4e3a
4037660  7028 302c 3836 2900 5f5f 3074 6869 733a 7228 302c 3130 3929 005f 5f31 423a 2830 2c31 3130 293d 2a28 302c 3130 3029 005f
4037740  5f30 5f5f 4b36 353a 2830 2c31 3131 293d 2a28 302c 3838 2900 5f5f 305f 5f58 4230 3079 696a 306c 653a 2830 2c37 3829 005f
4040020  5f30 7468 6973 203a 5a74 6c00 5f5f 304e 203a 5a74 6c00 5f5f 3142 203a 5a74 6c00 5f5f 305f 5f4b 3635 203a 5a74 6c00 4c6f
4040100  6164 5f56 4844 4c5f 4461 7461 5f5f 3131 4449 6372 656d 656e 746f 7246 5037 4e4f 626a 6563 7420 3a5a 7446 0043 6f6d 706f
4040160  7365 5f4d 6f64 4765 6e5f 4465 7363 7269 7074 6f72 5f5f 3131 4449 6372 656d 656e 746f 7246 5063 3a46 2830 2c32 3029 005f
4040240  5f30 7468 6973 3a70 2830 2c31 3039 2900 5f5f 3062 7566 663a 7028 302c 3230 2900 5f5f 3074 6869 733a 7228 302c 3130 3929
4040320  005f 5f30 7468 6973 203a 5a74 6c00 5f5f 3062 7566 6620 3a5a 746c 0043 6f6d 706f 7365 5f4d 6f64 4765 6e5f 4465 7363 7269
4040400  7074 6f72 5f5f 3131 4449 6372 656d 656e 746f 7246 5063 203a 5a74 4600 5f5f 7374 695f 5f44 4963 7265 6d65 6e74 6f72 5f63
4040460  7978 5f73 6574 496e 6465 785f 3a46 2830 2c32 2900 2f75 7372 2f43 432f 7375 6e34 2f69 6e63 6c2f 696f 7374 7265 616d 2e68
4040540  005f 5f73 7464 5f5f 4449 6372 656d 656e 745f 725f 6378 785f 7365 7449 6e64 6578 5f3a 4628 302c 3229 005f 5f76 7462 6c5f
4040620  5f31 3144 4963 7265 6d65 6e74 6f72 3a47 2830 2c31 3132 293d 6172 2830 2c31 293b 303b 363b 2830 2c31 3529 005f 5f76 7462
4040700  6c5f 5f31 3662 6c6f 636b 5f61 7474 7269 6275 7465 735f 5f44 4963 7265 6d65 6e74 6f72 5f63 7878 3a47 2830 2c31 3133 293d
4040760  6172 2830 2c31 293b 303b 3130 3b28 302c 3135 2900 5f5f 7674 626c 5f5f 384c 504f 626a 6563 745f 5f44 4963 7265 6d65 6e74
4041040  6f72 5f63 7878 3a47 2830 2c31 3134 293d 6172 2830 2c31 293b 303b 333b 2830 2c31 3529 0073 6574 4e61 6d65 496e 6465 785f
4041120  5f31 3144 4963 7265 6d65 6e74 6f72 4650 633a 6628 302c 3229 005f 5f30 7468 6973 3a70 2830 2c31 3039 2900 5f5f 3074 3a70
4041200  2830 2c32 3029 002e 2f68 7878 2f44 4963 7265 6d65 6e74 6f72 2e68 7878 005f 5f30 7468 6973 203a 5a74 6c00 5f5f 3074 203a
4041260  5a74 6c00 7365 744e 616d 6549 6e64 6578 5f5f 3131 4449 6372 656d 656e 746f 7246 5063 203a 5a74 4600 7365 745f 4655 5f46
4041340  696c 654e 616d 655f 5f38 4669 6c65 556e 6974 4650 633a 6628 302c 3229 005f 5f30 7468 6973 3a70 2830 2c31 3135 293d 2a28
4041420  302c 3130 3429 005f 5f30 733a 7028 302c 3230 2900 2f68 6f6d 652f 6f73 6173 312f 612f 6162 2f73 7263 2f6e 6577 6f62 6a65
4041500  6374 732f 7072 6f67 2f68 7878 2f46 696c 6555 6e2e 6878 7800 5f5f 3074 6869 733a 7228 302c 3131 3529 005f 5f30 7468 6973
4041560  203a 5a74 6c00 5f5f 3073 203a 5a74 6c00 7365 745f 4655 5f46 696c 654e 616d 655f 5f38 4669 6c65 556e 6974 4650 6320 3a5a
4041640  7446 0065 7870 6c61 696e 5f5f 3136 626c 6f63 6b5f 6174 7472 6962 7574 6573 4650 633a 6628 302c 3229 005f 5f30 7468 6973
4041720  3a70 2830 2c31 3136 293d 2a28 302c 3938 2900 5f5f 3073 3a70 2830 2c32 3029 002f 686f 6d65 2f6f 7361 7331 2f61 2f61 622f
4042000  7372 632f 6e65 776f 626a 6563 7473 2f70 726f 672f 6878 782f 6174 7472 6962 7574 652e 6878 7800 5f5f 3074 6869 733a 7228
4042060  302c 3131 3629 005f 5f30 7468 6973 203a 5a74 6c00 5f5f 3073 203a 5a74 6c00 6578 706c 6169 6e5f 5f31 3662 6c6f 636b 5f61
4042140  7474 7269 6275 7465 7346 5063 203a 5a74 4600 7365 745f 7061 7261 6d65 7465 725f 7661 6c75 655f 7479 7065 5f5f 3970 6172
4042220  616d 6574 6572 4650 633a 6628 302c 3229 005f 5f30 7468 6973 3a70 2830 2c39 3729 005f 5f30 733a 7028 302c 3230 2900 2f68
4042300  6f6d 652f 6f73 6173 312f 612f 6162 2f73 7263 2f6e 6577 6f62 6a65 6374 732f 7072 6f67 2f68 7878 2f70 6172 616d 6574 6572
4042360  2e68 7878 005f 5f30 7468 6973 3a72 2830 2c39 3729 005f 5f30 7468 6973 203a 5a74 6c00 5f5f 3073 203a 5a74 6c00 7365 745f
4042440  7061 7261 6d65 7465 725f 7661 6c75 655f 7479 7065 5f5f 3970 6172 616d 6574 6572 4650 6320 3a5a 7446 0065 7870 6c61 696e
4042520  5f5f 384c 504f 626a 6563 7446 5063 3a66 2830 2c32 2900 5f5f 3074 6869 733a 7028 302c 3131 3729 3d2a 2830 2c38 3529 005f
4042600  5f30 733a 7028 302c 3230 2900 2f68 6f6d 652f 6f73 6173 312f 612f 6162 2f73 7263 2f6e 6577 6f62 6a65 6374 732f 6878 782f
4042660  4c50 4f62 6a65 6374 5f64 622e 6878 7800 5f5f 3074 6869 733a 7228 302c 3131 3729 005f 5f30 7468 6973 203a 5a74 6c00 5f5f
4042740  3073 203a 5a74 6c00 6578 706c 6169 6e5f 5f38 4c50 4f62 6a65 6374 4650 6320 3a5a 7446 0069 734c 5445 5f5f 374e 4f62 6a65
```

```
4043020  6374 4650 364f 626a 6563 743a 6628 302c 3129 005f 5f30 7468 6973 3a70 2830 2c38 3629 005f 5f30 5f5f 4133 393a 7028 302c
4043100  3131 3829 3d2a 2830 2c37 3929 002f 686f 6d65 2f6f 7361 7331 2f61 2f61 622f 7372 632f 6e65 776f 626a 6563 7473 2f68 7878
4043160  2f4e 4f62 6a65 6374 5f64 622e 6878 7800 5f5f 3074 6869 7320 3a5a 746c 005f 5f30 5f5f 4133 3920 3a5a 746c 0069 734c 5445
4043240  5f5f 374e 4f62 6a65 6374 4650 364f 626a 6563 7420 3a5a 7446 0069 7347 5445 5f5f 374e 4f62 6a65 6374 4650 364f 626a 6563
4043320  743a 6628 302c 3129 005f 5f30 7468 6973 3a70 2830 2c38 3629 005f 5f30 5f5f 4133 383a 7028 302c 3131 3829 005f 5f30 7468
4043400  6973 203a 5a74 6c00 5f5f 305f 5f41 3338 203a 5a74 6c00 6973 4754 455f 5f37 4e4f 626a 6563 7446 5036 4f62 6a65 6374 203a
4043460  5a74 4600 7365 7450 726f 705f 5f37 4e4f 626a 6563 7446 5063 663a 6628 302c 3229 005f 5f30 7468 6973 3a70 2830 2c38 3629
4043540  005f 5f31 5f5f 4133 363a 7028 302c 3230 2900 5f5f 315f 5f41 3337 3a70 2830 2c31 3029 005f 5f30 7468 6973 203a 5a74 6c00
4043620  5f5f 315f 5f41 3336 203a 5a74 6c00 5f5f 315f 5f41 3337 203a 5a74 6c00 7365 7450 726f 705f 5f37 4e4f 626a 6563 7446 5063
4043700  6620 3a5a 7446 0073 6574 5072 6f70 5f5f 374e 4f62 6a65 6374 4650 6369 3a66 2830 2c32 2900 5f5f 3074 6869 733a 7028 302c
4043760  3836 2900 5f5f 315f 5f41 3334 3a70 2830 2c32 3029 005f 5f31 5f5f 4133 353a 7028 302c 3129 005f 5f30 7468 6973 203a 5a74
4044040  6c00 5f5f 315f 5f41 3334 203a 5a74 6c00 5f5f 315f 5f41 3335 203a 5a74 6c00 7365 7450 726f 705f 5f37 4e4f 626a 6563 7446
4044120  5063 6920 3a5a 7446 0073 6574 5072 6f70 5f5f 374e 4f62 6a65 6374 4650 6354 313a 6628 302c 3229 005f 5f30 7468 6973 3a70
4044200  2830 2c38 3629 005f 5f31 5f5f 4133 323a 7028 302c 3230 2900 5f5f 315f 5f41 3333 3a70 2830 2c32 3029 005f 5f30 7468 6973
4044260  203a 5a74 6c00 5f5f 315f 5f41 3332 203a 5a74 6c00 5f5f 315f 5f41 3333 203a 5a74 6c00 7365 7450 726f 705f 5f37 4e4f 626a
4044340  6563 7446 5063 5431 203a 5a74 4600 6765 7450 726f 705f 5f37 4e4f 626a 6563 7446 5063 693a 6628 302c 3230 2900 5f5f 3074
4044420  6869 733a 7028 302c 3836 2900 5f5f 305f 5f41 3330 3a70 2830 2c32 3029 005f 5f30 5f5f 4133 313a 7028 302c 3129 005f 5f30
4044500  7468 6973 203a 5a74 6c00 5f5f 305f 5f41 3330 203a 5a74 6c00 5f5f 305f 5f41 3331 203a 5a74 6cC0 6765 7450 726f 705f 5f37
4044560  4e4f 626a 6563 7446 5063 5920 3a5a 7446 0067 6574 4174 7472 5f5f 374e 4f62 6a65 6374 4669 3a66 2830 2c32 3029 005f 5f30
4044640  7468 6973 3a70 2830 2c38 3629 005f 5f30 5f5f 4132 393a 7028 302c 3129 005f 5f30 7468 6973 203a 5a74 6c00 5f5f 305f 5f41
4044720  3239 203a 5a74 6c00 6765 7441 7474 725f 5f37 4e4f 626a 6563 7446 6920 3a5a 7446 0069 6e4f 7264 6572 5f5f 364f 626a 6563
4045000  7446 5036 4f62 6a65 6374 3a66 2830 2c31 2900 5f5f 3074 6869 733a 7028 302c 3131 3829 005f 5f30 5f5f 4132 373a 7028 302c
4045060  3131 3829 002f 686f 6d65 2f6f 7361 7331 2f61 2f61 622f 7372 632f 6e65 776f 626a 6563 7473 2f68 7878 2f4f 626a 6563 745f
4045140  6462 2e68 7878 005f 5f30 7468 6973 203a 5a74 6c00 5f5f 305f 5f41 3237 203a 5a74 6c00 696e 4f72 6465 725f 5f36 4f62 6a65
4045220  6374 4650 364f 626a 6563 7420 3a5a 7446 0046 6966 6f2e 6f00 5f73 6574 5f70 6172 616d 6574 6572 5f76 616c 7565 5f74 7970
4045300  655f 5f39 7061 7261 6d65 7465 7246 5063 005f 7365 7450 726f 705f 5f37 4e4f 626a 6563 7446 5063 6600 5f73 6574 5072 6f70
4045360  5f5f 374e 4f62 6a65 6374 4650 6369 005f 6578 706c 6169 6e5f 5f31 3662 6c6f 636b 5f61 7474 7269 6275 7465 7346 5063 005f
4045440  6765 7441 7474 725f 5f37 4e4f 626a 6563 7446 6900 5f73 6574 5f46 555f 4669 6c65 4e61 6d65 5f5f 3846 696c 6555 6e69 7446
4045520  5063 005f 7075 745f 5f37 6f73 7472 6561 6d46 6300 5f73 6574 5072 6f70 5f5f 374e 4f62 6a65 6374 4650 6354 3100 5f73 6574
4045600  4e61 6d65 496e 6465 785f 5f34 4669 666f 4650 6300 5f69 6f73 7472 6561 6d5f 696e 6974 005f 6973 4c54 455f 5f37 4e4f 626a
4045660  6563 7446 5036 4f62 6a65 6374 005f 6973 4754 455f 5f37 4e4f 626a 6563 7446 5036 4f62 6a65 6374 005f 6578 706c 6169 6e5f
4045740  5f38 4c50 4f62 6a65 6374 4650 6300 5f67 6574 5072 6f70 5f5f 374e 4f62 6a65 6374 4650 6369 005f 5f5f 6374 5f5f 3665 6e74
4046020  6974 7946 7600 5f69 6e4f 7264 6572 5f5f 364f 626a 6563 7446 5036 4f62 6a65 6374 002f 686f 6d65 2f6f 7361 7331 2f61 2f61
4046100  622f 7372 632f 6e65 776f 626a 6563 7473 2f70 726f 672f 4d47 2f43 2b2b 2e32 3238 3836 2f00 4669 666f 2e63 0046 6966 6f2e
4046160  6378 7800 696e 743a 7428 302c 3129 3d72 2830 2c31 293b 2d32 3134 3734 3833 3634 383b 3231 3437 3438 3336 3437 3b00 6368
4046240  6172 3a74 2830 2c32 293d 7228 302c 3229 3b30 3b31 3237 3b00 6c6f 6e67 3a74 2830 2c33 293d 7228 302c 3129 3b2d 3231 3437
4046320  3438 3336 3438 3b32 3134 3734 3833 3634 373b 0073 686f 7274 3a74 2830 2c34 293d 7228 302c 3129 3b2d 3332 3736 383b 3332
4046400  3736 373b 0075 6e73 6967 6e65 6420 6368 6172 3a74 2830 2c35 293d 7228 302c 3129 3b30 3b32 3535 3b00 756e 7369 676e 6564
4046460  2073 686f 7274 3a74 2830 2c36 293d 7228 302c 3129 3b30 3b36 3535 3335 3b00 756e 7369 676e 6564 206c 6f6e 673a 7428 302c
4046540  3729 3d72 2830 2c31 293b 303b 2131 3b00 756e 7369 676e 6564 2069 6e74 3a74 2830 2c38 293d 7228 302c 3129 3b30 3b2d 313b
4046620  0066 6c6f 6174 3a74 2830 2c39 293d 7228 302c 3129 3b34 3b30 3b00 646f 7562 6c65 3a74 2830 2c31 3029 3d72 2830 2c31 293b
4046700  383b 303b 0076 6f69 643a 7428 302c 3131 293d 2830 2c31 3129 003f 3f3f 3a74 2830 2c31 3229 3d28 302c 3129 005f 5f76 7074
4046760  703a 7428 302c 3133 293d 2a28 302c 3134 293d 6628 302c 3129 005f 5f6d 7074 723a 5428 302c 3135 293d 7338 643a 2830 2c34
4047040  292c 302c 3136 3b69 3a28 302c 3429 2c31 362c 3136 3b66 3a28 302c 3133 292c 3332 2c33 323b 3b00 5f50 4656 5f3a 7428 302c
4047120  3136 293d 2a28 302c 3137 293d 6628 302c 3229 005f 5046 495f 3a74 2830 2c31 3329 0065 7272 6e6f 3a47 2830 2c31 2900 7379
4047200  735f 6e65 7272 3a47 2830 2c31 2900 656e 7669 726f 6e3a 4728 302c 3139 293d 2a28 302c 3230 293d 2a28 302c 3229 0065 6e64
4047260  3a47 2830 2c31 2900 6574 6578 743a 4728 302c 3129 0065 6461 7461 3a47 2830 2c31 2900 6f70 7461 7267 3a47 2830 2c32 3029
4047340  006f 7074 696e 643a 4728 302c 3129 006f 7074 6572 723a 4728 302c 3129 0070 7472 6469 6666 5f74 3a74 2830 2c31 2900 7369
4047420  7a65 5f74 3a74 2830 2c38 2900 7374 7265 616d 706f 733a 7428 302c 3129 0073 7472 6561 6d6f 6666 3a74 2830 2c31 2900 696f
4047500  5f73 7461 7465 3a54 2830 2c32 3129 3d65 676f 6f64 6269 745f 5f69 6f5f 7374 6174 653a 302c 656f 6662 6974 5f5f 696f 5f73
4047560  7461 7465 3a31 2c66 6169 6c62 6974 5f5f 696f 5f73 7461 7465 3a32 2c62 6164 6269 745f 5f69 6f5f 7374 6174 653a 332c 6861
4047640  7264 6661 696c 5f5f 696f 5f73 7461 7465 3a34 2c3b 006f 7065 6e5f 6d6f 6465 3a54 2830 2c32 3229 3d65 696e 5f5f 6f70 656e
4047720  5f6d 6f64 653a 302c 6f75 745f 5f6f 7065 6e5f 6d6f 6465 3a31 2c61 7465 5f5f 6f70 656e 5f6d 6f64 653a 322c 6170 705f 5f6f
4050000  7065 6e5f 6d6f 6465 3a33 2c74 7275 6e63 5f5f 6f70 656e 5f6d 6f64 653a 342c 6e6f 6372 6561 7465 5f5f 6f70 656e 5f6d 6f64
4050060  653a 352c 6e6f 7265 706c 6163 655f 5f6f 7065 6e5f 6d6f 6465 3a36 2c3b 0073 6565 6b5f 6469 723a 5428 302c 3233 293d 6562
```

| | | | | | | | | | | | | | | | | | | | | | | | | |
|---|---|---|---|---|---|---|---|---|---|---|---|---|---|---|---|---|---|---|---|---|---|---|---|---|
| 4050140 | 6567 | 5f5f | 7365 | 656b | 5f64 | 6972 | 3a30 | 2c63 | 7572 | 5f5f | 7365 | 656b | 5f64 | 6972 | 3a31 | 2c65 | 6e64 | 5f5f | 7365 | 656b | 5f64 | 6972 | 3a32 | 2c3b |
| 4050220 | 005f | 5f45 | 313a | 5428 | 302c | 3234 | 293d | 6573 | 6b69 | 7077 | 735f | 5f5f | 5f45 | 313a | 302c | 6c65 | 6674 | 5f5f | 5f5f | 4531 | 3a31 | 2c72 | 6967 | 6874 |
| 4050300 | 5f5f | 5f5f | 4531 | 3a32 | 2c69 | 6e74 | 6572 | 6e61 | 6c5f | 5f5f | 5f45 | 313a | 332c | 6465 | 635f | 5f5f | 5f45 | 313a | 342c | 6f63 | 745f | 5f5f | 5f45 | 313a |
| 4050360 | 352c | 6865 | 785f | 5f5f | 5f45 | 313a | 362c | 7368 | 6f77 | 6261 | 7365 | 5f5f | 5f5f | 4531 | 3a37 | 2c5c | 0073 | 686f | 7770 | 6f69 | 6e74 | 5f5f | 5f5f | 4531 |
| 4050440 | 3a38 | 2c75 | 7070 | 6572 | 6361 | 7365 | 5f5f | 5f5f | 4531 | 3a39 | 2c73 | 686f | 7770 | 6f73 | 5f5f | 5f5f | 4531 | 3a31 | 302c | 7363 | 6965 | 6e74 | 6966 | 6963 |
| 4050520 | 5f5f | 5f5f | 4531 | 3a31 | 312c | 6669 | 7865 | 645f | 5f5f | 5f45 | 313a | 3132 | 2c75 | 6e69 | 7462 | 7566 | 5f5f | 5f5f | 4531 | 3a31 | 332c | 7374 | 6469 | 6f5f |
| 4050600 | 5f5f | 5f45 | 313a | 3134 | 2c3b | 005f | 5f45 | 323a | 5428 | 302c | 3235 | 293d | 6573 | 6b69 | 7070 | 696e | 675f | 5f5f | 5f45 | 323a | 302c | 7469 | 6564 | 5f5f |
| 4050660 | 5f5f | 4532 | 3a31 | 2c3b | 0069 | 6f73 | 3a54 | 2830 | 2c32 | 3629 | 3d73 | 3630 | 6e75 | 7365 | 725f | 5f33 | 696f | 733a | 2830 | 2c31 | 292c | 302c | 3332 | 3b78 |
| 4050740 | 5f75 | 7365 | 725f | 5f33 | 696f | 733a | 2830 | 2c33 | 1029 | 3d2a | 2930 | 2c32 | 3729 | 3d78 | 7569 | 6f73 | 5f75 | 7365 | 725f | 756e | 696f | 6e3a | 2c33 | 322c |
| 4051020 | 3332 | 3b62 | 705f | 5f33 | 696f | 733a | 2830 | 2c33 | 3129 | 3d2a | 2830 | 2c32 | 3829 | 3d78 | 7373 | 7472 | 6561 | 6d62 | 7566 | 3a2c | 3634 | 2c33 | 323b | 7374 |
| 4051100 | 6174 | 655f | 5f33 | 696f | 733a | 2830 | 2c31 | 292c | 3936 | 2c33 | 323b | 6973 | 7065 | 6369 | 616c | 5f5f | 3369 | 6f73 | 3a28 | 302c | 3129 | 2c31 | 3238 | 2c33 |
| 4051160 | 323b | 6f73 | 7065 | 6369 | 616c | 5f5f | 3369 | 6f73 | 3a28 | 302c | 3129 | 2c31 | 3630 | 2c33 | 323b | 6973 | 6678 | 5f73 | 7065 | 6369 | 616c | 5f5f | 3369 | 6f73 |
| 4051240 | 3a28 | 302c | 3129 | 2c31 | 3932 | 2c33 | 323b | 6f73 | 6678 | 5f73 | 7065 | 6369 | 616c | 5f5f | 3369 | 6f73 | 3a28 | 302c | 3129 | 2c32 | 3234 | 2c33 | 323b | 5c00 |
| 4051320 | 6465 | 6c62 | 7566 | 5f5f | 3369 | 6f73 | 3a28 | 302c | 3129 | 2c32 | 3536 | 2c33 | 323b | 785f | 7469 | 655f | 5f33 | 696f | 733a | 2830 | 2c33 | 3229 | 3d2a | 2830 |
| 4051400 | 2c32 | 3929 | 3d78 | 736f | 7374 | 7265 | 616d | 3a2c | 3238 | 382c | 3332 | 3b78 | 5f66 | 6c61 | 6773 | 5f5f | 3369 | 6f73 | 3a28 | 302c | 3129 | 2c33 | 3230 | 2c33 |
| 4051460 | 323b | 785f | 7072 | 6563 | 6973 | 696f | 6e5f | 5f33 | 696f | 733a | 2830 | 2c34 | 292c | 3335 | 322c | 3136 | 3b78 | 5f66 | 696c | 6c5f | 5f33 | 696f | 733a | 2830 |
| 4051540 | 2c32 | 292c | 3336 | 382c | 383b | 785f | 7769 | 6474 | 685f | 5f33 | 696f | 733a | 2830 | 2c34 | 292c | 3338 | 342c | 3136 | 3b61 | 7373 | 6967 | 6e5f | 7072 | 6976 |
| 4051620 | 6174 | 655f | 5f33 | 696f | 733a | 2830 | 2c31 | 292c | 3431 | 362c | 3332 | 3b5f | 5f76 | 7074 | 725f | 5f33 | 696f | 733a | 2830 | 2c33 | 3329 | 3d2a | 2830 | 2c31 |
| 4051700 | 3529 | 2c34 | 3438 | 2c33 | 323b | 3b00 | 6261 | 7365 | 6669 | 656c | 645f | 5f33 | 696f | 733a | 4728 | 302c | 3129 | 0061 | 646a | 7573 | 7466 | 6965 | 6c64 | 5f5f |
| 4051760 | 3369 | 6f73 | 3a47 | 2830 | 2c31 | 2900 | 666c | 6f61 | 7466 | 6965 | 6c64 | 5f5f | 3369 | 6f73 | 3a47 | 2830 | 2c31 | 2900 | 6e65 | 7874 | 6269 | 745f | 5f33 | 696f |
| 4052040 | 733a | 4728 | 302c | 3129 | 006e | 6578 | 7477 | 6f72 | 645f | 5f33 | 696f | 733a | 4728 | 302c | 3129 | 0073 | 7464 | 696f | 666c | 7573 | 685f | 5f33 | 696f | 733a |
| 4052120 | 4728 | 302c | 3136 | 2909 | 696f | 733a | 5a63 | 696f | 733b | 3b5f | 5f63 | 745f | 5f33 | 696f | 7346 | 5039 | 7374 | 7265 | 616d | 6275 | 6620 | 5f5f | 6374 | 5f5f |
| 4052200 | 3369 | 6f73 | 4676 | 205f | 5f63 | 745f | 5f33 | 696f | 7346 | 5233 | 696f | 7320 | 5f5f | 6474 | 5f5f | 3369 | 6f73 | 4676 | 2066 | 6c61 | 6773 | 5f5f | 3369 | 6f73 |
| 4052260 | 4676 | 2066 | 6c61 | 6773 | 5f5f | 3369 | 6f73 | 466c | 2073 | 6574 | 665f | 5f33 | 696f | 7346 | 6c54 | 3120 | 7365 | 7466 | 5f5f | 3369 | 6f73 | 466c | 2075 | 6e73 |
| 4052340 | 6574 | 665f | 5f33 | 696f | 7346 | 6c20 | 7769 | 6474 | 585f | 5f33 | 696f | 7346 | 7620 | 7769 | 6474 | 685f | 5f33 | 696f | 7346 | 6920 | 7469 | 655f | 5f33 | 696f |
| 4052420 | 7346 | 5037 | 6f73 | 7472 | 6561 | 6d20 | 5c00 | 7469 | 655f | 5f33 | 696f | 7346 | 7620 | 6669 | 6c6c | 5f5f | 3369 | 6f73 | 4663 | 2066 | 696c | 6c5f | 5f33 | 696f |
| 4052500 | 7346 | 7620 | 7072 | 6563 | 6973 | 696f | 6e5f | 5f33 | 696f | 7346 | 6920 | 7072 | 6563 | 6973 | 696f | 6e5f | 5f33 | 696f | 7346 | 7620 | 7264 | 7374 | 6174 | 655f |
| 4052560 | 5f33 | 696f | 7346 | 7620 | 5f5f | 6f70 | 5076 | 5f5f | 3369 | 6f73 | 4676 | 205f | 5f6e | 745f | 5f33 | 696f | 7346 | 7620 | 656f | 665f | 5f33 | 696f | 7346 | 7620 |
| 4052640 | 6661 | 696c | 5f5f | 3369 | 6f73 | 4676 | 2062 | 6164 | 5f5f | 3369 | 6f73 | 4676 | 2067 | 6f6f | 645f | 5f33 | 696f | 7346 | 7620 | 636c | 6561 | 725f | 5f33 | 696f |
| 4052720 | 7346 | 6920 | 7264 | 6275 | 665f | 5f33 | 696f | 7346 | 7620 | 5c00 | 6977 | 6f72 | 645f | 5f33 | 696f | 7346 | 6920 | 7077 | 6f72 | 645f | 5f33 | 696f | 7346 | 6920 |
| 4053000 | 6269 | 7461 | 6c6c | 6f63 | 5f5f | 3369 | 6f73 | 5346 | 7620 | 7861 | 6c6c | 6f63 | 5f5f | 3369 | 6f73 | 5346 | 7620 | 7572 | 6573 | 697a | 655f | 5f33 | 696f | 7346 |
| 4053060 | 6920 | 7379 | 6e63 | 5f77 | 6974 | 685f | 7374 | 6469 | 6f5f | 5f33 | 696f | 7353 | 4676 | 2073 | 6574 | 7374 | 6174 | 655f | 5f33 | 696f | 7346 | 6920 | 696e | 6974 |
| 4053140 | 5f5f | 3369 | 6f73 | 4650 | 3973 | 7472 | 6561 | 6d62 | 7566 | 205f | 5f61 | 735f | 5f33 | 696f | 7346 | 5233 | 696f | 7320 | 736b | 6970 | 5f5f | 3369 | 6f73 | 4669 |
| 4053220 | 203b | 6261 | 7365 | 6669 | 656c | 645f | 5f33 | 696f | 7320 | 5c00 | 6164 | 6a75 | 7374 | 6669 | 656c | 645f | 5f33 | 696f | 7320 | 666c | 6f61 | 7466 | 6965 | 6c64 |
| 4053300 | 5f5f | 3369 | 6f73 | 206e | 6578 | 7462 | 6974 | 5f5f | 3369 | 6f73 | 206e | 6578 | 7477 | 6f72 | 645f | 5f33 | 696f | 7320 | 7374 | 6469 | 6f66 | 6c75 | 7368 | 5f5f |
| 4053360 | 3369 | 6f73 | 203b | 3b00 | 7374 | 7265 | 616d | 6275 | 663a | 5428 | 302c | 3238 | 293d | 7334 | 3061 | 6c6c | 6f63 | 5f5f | 3973 | 7472 | 6561 | 6d62 | 7566 | 3a28 |
| 4053440 | 302c | 3429 | 2c30 | 2c31 | 363b | 785f | 756e | 6275 | 665f | 5f39 | 7374 | 7265 | 616d | 6275 | 663a | 2830 | 2c34 | 292c | 3136 | 2c31 | 363b | 785f | 6261 | 7365 |
| 4053520 | 5f5f | 3973 | 7472 | 6561 | 6d62 | 7566 | 3a28 | 302c | 3230 | 292c | 3332 | 2c33 | 323b | 785f | 7062 | 6173 | 655f | 5f39 | 7374 | 7265 | 616d | 6275 | 663a | 2830 |
| 4053600 | 2c32 | 3029 | 2c36 | 342c | 3332 | 3b78 | 5f70 | 7074 | 725f | 5f39 | 7374 | 7265 | 616d | 6275 | 663a | 2830 | 2c32 | 3029 | 2c39 | 362c | 3332 | 3b78 | 5f65 | 7070 |
| 4053660 | 7472 | 5f5f | 3973 | 7472 | 6561 | 6d62 | 7566 | 3a28 | 302c | 3230 | 292c | 3132 | 382c | 3332 | 3b78 | 5f67 | 7074 | 725f | 5f39 | 7374 | 7265 | 616d | 6275 | 663a |
| 4053740 | 2830 | 2c32 | 3029 | 2c31 | 3630 | 2c33 | 323b | 785f | 6567 | 7074 | 725f | 5f39 | 7374 | 7265 | 616d | 6275 | 663a | 2830 | 2c32 | 3029 | 2c31 | 3932 | 2c33 | 323b |
| 4054020 | 5c00 | 785f | 6562 | 6163 | 6b5f | 5f39 | 7374 | 7265 | 616d | 6275 | 663a | 2830 | 2c32 | 3029 | 2c32 | 3234 | 2c33 | 323b | 785f | 626c | 656e | 5f5f | 3973 | 7472 |
| 4054100 | 6561 | 6d62 | 7566 | 3a28 | 302c | 3129 | 2c32 | 3536 | 2c33 | 323b | 5f5f | 7670 | 7472 | 5f5f | 3973 | 7472 | 6561 | 6d62 | 7566 | 3a28 | 302c | 3333 | 292c | 3238 |
| 4054160 | 382c | 3332 | 3b3b | 0073 | 7472 | 6561 | 6d62 | 7566 | 3a5a | 6373 | 7472 | 6561 | 6d62 | 7566 | 3b3b | 5f5f | 6374 | 5f5f | 3973 | 7472 | 6561 | 6d62 | 7566 | 4652 |
| 4054240 | 3973 | 7472 | 6561 | 6d62 | 7566 | 205f | 5f63 | 745f | 5f39 | 7374 | 7265 | 616d | 6275 | 6646 | 7620 | 5f5f | 6374 | 5f5f | 3973 | 7472 | 6561 | 6d62 | 7566 | 4650 |
| 4054320 | 6369 | 205f | 5f63 | 745f | 5f39 | 7374 | 7265 | 616d | 6275 | 6646 | 5063 | 6954 | 3220 | 5f5f | 6173 | 5f5f | 3973 | 7472 | 6561 | 6d62 | 7566 | 4652 | 3973 | 7472 |
| 4054400 | 6561 | 6d62 | 7566 | 2064 | 6270 | 5f5f | 3973 | 7472 | 6561 | 6d62 | 7566 | 4676 | 2062 | 6173 | 655f | 5f39 | 7374 | 7265 | 616d | 6275 | 6646 | 7620 | 7062 | 6173 |
| 4054460 | 655f | 5f39 | 7374 | 7265 | 616d | 6275 | 6646 | 7620 | 5c00 | 7070 | 7472 | 5f5f | 3973 | 7472 | 6561 | 6d62 | 7566 | 4676 | 2065 | 7070 | 7472 | 5f5f | 3973 | 7472 |
| 4054540 | 6561 | 6d62 | 7566 | 4676 | 2067 | 7074 | 725f | 5f39 | 7374 | 7265 | 616d | 6275 | 6646 | 7620 | 6567 | 7074 | 725f | 5f39 | 7374 | 7265 | 616d | 6275 | 6646 | 7620 |
| 4054620 | 6562 | 6163 | 6b5f | 5f39 | 7374 | 7265 | 616d | 6275 | 6646 | 7620 | 6562 | 7566 | 5f5f | 3973 | 7472 | 6561 | 6d62 | 7566 | 4676 | 2062 | 6c65 | 6e5f | 5f39 | 7374 |
| 4054700 | 7265 | 616d | 6275 | 6646 | 7620 | 7365 | 7470 | 5f5f | 3973 | 7472 | 6561 | 6d62 | 7566 | 4650 | 6354 | 3120 | 7365 | 7467 | 5f5f | 3973 | 7472 | 6561 | 6d62 | 7566 |
| 4054760 | 4650 | 634e | 3231 | 2070 | 6275 | 6d70 | 5f5f | 3973 | 7472 | 6561 | 6d62 | 7566 | 4669 | 205c | 0067 | 6275 | 6d70 | 5f5f | 3973 | 7472 | 6561 | 6d62 | 7566 | 4669 |
| 4055040 | 2073 | 6574 | 625f | 5f39 | 7374 | 7265 | 616d | 6275 | 6646 | 5063 | 5431 | 6920 | 756e | 6275 | 6666 | 6572 | 6564 | 5f5f | 3973 | 7472 | 6561 | 6d62 | 7566 | 4676 |
| 4055120 | 2075 | 6e62 | 7566 | 6665 | 7265 | 645f | 5f39 | 7374 | 7265 | 616d | 6275 | 6646 | 6920 | 616c | 6c6f | 6361 | 7465 | 5f5f | 3973 | 7472 | 6561 | 6d62 | 7566 | 4676 |
| 4055200 | 2064 | 6f61 | 6c6c | 6f63 | 6174 | 655f | 5f39 | 7374 | 7265 | 616d | 6275 | 6646 | 7620 | 6f76 | 6572 | 666c | 6f77 | 5f5f | 3973 | 7472 | 6561 | 6d62 | 7566 | 4669 |

```
4055260 2075 6e64 6572 666c 6f77 5f5f 3973 7472 6561 6d62 7566 4676 205c 0070 6261 636b 6661 696c 5f5f 3973 7472 6561 6d62 7566
4055340 4669 2073 796e 635f 5f39 7374 7265 616d 6275 6646 7620 7365 656b 6f66 665f 5f39 7374 7265 616d 6275 6646 6c38 7365 656b
4055420 5f64 6972 6920 7365 656b 706f 735f 5f39 7374 7265 616d 6275 6646 6c69 2078 7370 7574 6e5f 5f39 7374 7265 616d 6275 6646
4055500 5043 6369 2078 7367 6574 6e5f 5f39 7374 7265 616d 6275 6646 5063 6920 696e 5f61 7661 696c 5f5f 3973 7472 6561 6d62 7566
4055560 4676 206f 7574 5f77 6169 7469 6e67 5f5f 3973 7472 6561 6d62 7566 4676 205c 0073 6765 7463 5f5f 3973 7472 6561 6d62 7566
4055640 4676 2073 6e65 7974 635f 5f39 7374 7265 616d 6275 6646 7620 7362 756d 7063 5f5f 3973 7472 6561 6d62 7566 4676 2073 746f
4055720 7373 635f 5f39 7374 7265 616d 6275 6646 7620 7370 7574 6261 636b 635f 5f39 7374 7265 616d 6275 6646 6320 7370 7574 635f
4056000 5f39 7374 7265 616d 6275 6646 6920 7370 7574 6e5f 5f39 7374 7265 616d 6275 6646 5043 6369 2073 6765 746e 5f5f 3973 7472
4056060 6561 6d62 7566 4650 6369 2073 6574 6275 665f 5f39 7374 7265 616d 6275 6646 5063 6920 5c00 7365 7462 7566 5f5f 3973 7472
4056140 6561 6d62 7566 4650 5563 6920 7365 7462 7566 5f5f 3973 7472 6561 6d62 7566 4650 6369 5432 205f 5f64 745f 5f39 7374 7265
4056220 616d 6275 6646 7620 785f 736e 6578 7463 5f5f 3973 7472 6561 6d62 7566 4676 203b 3b3b 0069 7374 7265 616d 3a54 2830 2c33
4056300 3429 3d73 3732 795f 6763 6f75 6e74 5f5f 3769 7374 7265 616d 3a28 302c 3129 2c30 2c33 323b 5f5f 7670 7472 5f5f 3769 7374
4056360 7265 616d 3a28 302c 3333 292c 3332 2c33 323b 5069 6f73 3a28 302c 3335 293d 2a28 302c 3236 292c 3634 2c33 323b 4f69 6f73
4056440 3a28 302c 3236 292c 3936 2c34 3830 3b3b 0069 7374 7265 616d 3a5a 6369 7374 7265 616d 3b69 6f73 3b5f 5f63 745f 5f37 6973
4056520 7472 6561 6d46 5039 7374 7265 616d 6275 6620 5f5f 6374 5f5f 3769 7374 7265 616d 4676 205f 5f63 745f 5f37 6973 7472 6561
4056600 6d46 5039 7374 7265 616d 6275 6669 5037 6f73 7472 6561 6d20 5f5f 6374 5f5f 3769 7374 7265 616d 4669 5063 5431 205f 5f63
4056660 745f 5f37 6973 7472 6561 6d46 6954 3150 376f 7374 7265 616d 205f 5f63 745f 5f37 6973 7472 6561 6346 5237 6973 7472 6561
4056740 6d20 5f5f 6474 5f5f 3769 7374 7265 616d 4676 205c 0069 7066 785f 5f37 6973 7472 6561 6d46 6920 6973 6678 5f5f 3769 7374
4057020 7265 616d 4676 2073 6565 6b67 5f5f 3769 7374 7265 616d 466c 2073 6565 6b67 5f5f 3769 7374 7265 616d 466c 3873 6565 6b5f
4057100 6469 7220 7465 6c6c 675f 5f37 6973 7472 6561 6d46 7620 5f5f 7273 5f5f 3769 7374 7265 616d 4650 4652 3769 7374 7265 616d
4057160 5f52 3769 7374 7265 616d 205f 5f72 735f 5f37 6973 7472 6561 6d46 5046 5233 696f 735f 5233 696f 7320 5f5f 7273 5f5f 3769
4057240 7374 7265 616d 4650 6320 5f5f 7273 5f5f 3769 7374 7265 616d 4650 5563 205c 005f 5f72 735f 5f37 6973 7472 6561 6d46 5255
4057320 6320 5f5f 7273 5f5f 3769 7374 7265 616d 4652 6320 5f5f 7273 5f5f 3769 7374 7265 616d 4652 7320 5f5f 7273 5f5f 3769 7374
4057400 7265 616d 4652 6920 5f5f 7273 5f5f 3769 7374 7265 616d 4652 6c20 5f5f 7273 5f5f 3769 7374 7265 616d 4652 5573 205f 5f72
4057460 735f 5f37 6973 7472 6561 6d46 5255 6920 5f5f 7273 5f5f 3769 7374 7265 616d 4652 556c 205f 5f72 735f 5f37 6973 7472 6561
4057540 6d46 5266 205f 5f72 735f 5f37 6973 7472 6561 6d46 5264 205f 5f72 735f 5f37 6973 7472 6561 6d46 5039 7374 7265 616d 6275
4057620 6620 5c00 6765 745f 5f37 6973 7472 6561 6d46 5063 6963 2067 6574 5f5f 3769 7374 7265 616d 4650 5563 6963 2067 6574 5f5f
4057700 3769 7374 7265 616d 4652 3973 7472 6561 6d62 7566 6320 6765 745f 5f37 6973 7472 6561 6d46 5255 6320 6765 745f 5f37 6973
4057760 7472 6561 6d46 5263 2067 6574 5f5f 3769 7374 7265 616d 4676 2067 6574 6c69 6e65 5f5f 3769 7374 7265 616d 4650 6369 6320
4060040 6765 746c 696e 655f 5f37 6973 7472 6561 6d46 5055 6369 6320 7065 656b 5f5f 3769 7374 7265 616d 4676 2069 676e 6f72 655f
4060120 5f37 6973 7472 6561 6d46 6954 3120 5c00 7265 6164 5f5f 3769 7374 7265 616d 4650 6369 2072 6561 645f 5f37 6973 7472 6561
4060200 6d46 5055 6369 2067 636f 756e 745f 5f37 6973 7472 6561 6d46 7620 7075 7462 6163 6b5f 5f37 6973 7472 6561 6d46 6320 7379
4060260 6e63 5f5f 3769 7374 7265 616d 4676 2064 5f5f 6970 6678 5f5f 3769 7374 7265 616d 4669 2065 6174 7768 6974 655f 5f37 6973
4060340 7472 6561 6d46 7620 7867 6574 5f5f 3769 7374 7265 616d 4650 6320 3b3b 3b00 6f73 7472 6561 6d3a 5428 302c 3239 293d 7336
4060420 385f 5f76 7074 725f 5f37 6f73 7472 6561 6d3a 2830 2c33 3329 2c30 2c33 323b 5069 6f73 3a28 302c 3335 292c 3332 2c33 323b
4060500 4f69 6f73 3a28 302c 3236 292c 3634 2c34 3830 3b3b 006f 7374 7265 616d 3a5a 636f 7374 7265 616d 3b69 6f73 3b5f 5f63 745f
4060560 5f37 6f73 7472 6561 6d46 5039 7374 7265 616d 6275 6620 5f5f 6374 5f5f 376f 7374 7265 616d 4676 205f 5f63 745f 5f37 6f73
4060640 7472 6561 6d46 6920 5f5f 6374 5f5f 376f 7374 7265 616d 4669 5063 205f 5f63 745f 5f37 6f73 7472 6561 6d46 5237 6f73 7472
4060720 6561 6d20 5f5f 6474 5f5f 376f 7374 7265 616d 4676 206f 7066 785f 5f37 6f73 7472 6561 6d46 7620 6f73 6678 5f5f 376f 7374
4061000 7265 616d 4676 2066 6c75 7368 5f5f 376f 7374 7265 616d 4676 205c 0073 6565 6b70 5f5f 376f 7374 7265 616d 466c 2073 6565
4061060 6b70 5f5f 376f 7374 7265 616d 466c 3873 6565 6b5f 6469 7220 7465 6c6c 705f 5f37 6f73 7472 6561 6d46 7620 7075 745f 5f37
4061140 6f73 7472 6561 6146 6320 5f5f 6c73 5f5f 376f 7374 7265 616d 4663 205f 5f6c 735f 5f37 6f73 7472 6561 6d46 5563 205f 5f6c
4061220 735f 5f37 6f73 7472 6561 6d46 5043 6320 5f5f 6c73 5f5f 376f 7374 7265 616d 4669 205f 5f6c 735f 5f37 6f73 7472 6561 6d46
4061300 6c20 5f5f 6c73 5f5f 376f 7374 7265 616d 4664 205f 5f6c 735f 5f37 6f73 7472 6561 6d46 6620 5c00 5f5f 6c73 5f5f 376f 7374
4061360 7265 616d 4655 6920 5f5f 6c73 5f5f 376f 7374 7265 616d 4655 6c20 5f5f 6c73 5f5f 376f 7374 7265 616d 4650 7620 5f5f 6c73
4061440 5f5f 376f 7374 7265 616d 4650 3973 7472 6561 6d62 7566 205f 5f6c 735f 5f37 6f73 7472 6561 6d46 7320 5f5f 6c73 5f5f 376f
4061520 7374 7265 616d 4655 7320 5f5f 6c73 5f5f 376f 7374 7265 616d 4650 4652 376f 7374 7265 616d 5f52 376f 7374 7265 616d 205f
4061600 5f6c 735f 5f37 6f73 7472 6561 6d46 5046 5233 696f 735f 5233 696f 7320 7772 6974 655f 5f37 6f73 7472 6561 6d46 5043 6369
4061660 205c 0077 7269 7465 5f5f 376f 7374 7265 616d 4650 4355 6369 2064 6f5f 6f70 6678 5f5f 376f 7374 7265 616d 4676 2064 6f5f
4061740 6f73 6678 5f5f 376f 7374 7265 616d 4676 203b 3b3b 0070 7574 5f5f 376f 7374 7265 616d 4663 3a66 2830 2c33 3629 3d2a 2830
4062020 2c32 3929 005f 5f30 7468 6973 3a70 2830 2c33 3629 005f 5f30 633a 7028 302c 3229 002f 7573 722f 4343 2f73 756e 342f 696e
4062100 636c 2f69 6f73 7472 6561 6d2e 6800 5f5f 3074 6869 733a 7228 302c 3336 2900 5f5f 3074 6869 7320 3a5a 746c 005f 5f30 6320
4062160 3a5a 746c 0070 7574 5f5f 376f 7374 7265 616d 4663 203a 5a74 4600 696f 7374 7265 616d 3a54 2830 2c33 3729 3d73 3830 785f
4062240 6763 6f75 6e74 5f5f 3769 7374 7265 616d 3a28 302c 3129 2c30 2c33 323b 5f5f 7670 7472 5f5f 3769 7374 7265 616d 3a28 302c
4062320 3333 292c 3332 2c33 323b 5069 6f73 3a28 302c 3335 292c 3634 2c33 323b 4f6f 7374 7265 616d 3a28 302c 3239 292c 3936 2c35
```

4062400 3434 3b3b 0069 6f73 7472 6561 6d3a 5a63 696f 7374 7265 616d 3b69 7374 7265 616d 206f 7374 7265 616d 2069 6f73 3b5f 5f63
4062460 745f 5f38 696f 7374 7265 616d 4650 3973 7472 6561 6d62 7566 205f 5f63 745f 5f38 696f 7374 7265 616d 4676 205f 5f63 745f
4062540 5f38 696f 7374 7265 616d 4652 3869 6f73 7472 6561 6d20 5f5f 6474 5f5f 3869 6f73 7472 6561 6d46 7620 3b3b 3b00 6369 6e3a
4062620 4728 302c 3338 293d 7873 6973 7472 6561 6d5f 7769 7468 6173 7369 676e 3a00 636f 7574 3a47 2830 2c33 3929 3d78 736f 7374
4062700 7265 616d 5f77 6974 6861 7373 6967 6e3a 0063 6572 723a 4728 302c 3339 2900 636c 6f67 3a47 2830 2c33 3929 0049 6f73 7472
4062760 6561 6d5f 696e 6374 3a54 2830 2c34 3029 3d73 315f 5f57 395f 5f31 3349 6f73 7472 6561 6d5f 696e 6974 3a28 302c 3229 2c30
4063040 2c38 3b3b 0073 7464 7374 6174 7573 5f5f 3133 496f 7374 7265 616d 5f69 6e69 743a 4728 302c 3129 0369 6e69 7463 6f75 6e74
4063120 5f5f 3133 496f 7374 7265 616d 5f69 6e69 743a 4728 302c 3129 0049 6f73 7472 6561 6d5f 696e 6974 3a5a 6349 6f73 7472 6561
4063200 6d5f 696e 6974 3b3b 5f5f 6374 5f5f 3133 496f 7374 7265 616d 5f69 6e69 7446 7620 5f5f 6474 5f5f 3133 496f 7374 7265 616d
4063260 5f69 6e69 7446 7620 3b73 7464 7374 6174 7573 5f5f 3133 496f 7374 7265 616d 5f69 6e69 7420 696e 6974 636f 756e 745f 5f31
4063340 3349 6f73 7472 6561 6d5f 696e 6974 203b 4069 6f73 3b00 696f 7374 7265 616d 5f69 6e69 743a 5328 302c 3430 2900 4750 543a
4063420 7428 302c 3133 2700 736d 616e 6970 5f69 6e74 3a54 2830 2c34 3129 3d73 3866 6374 5f5f 3130 736d 616e 6970 5f69 6e74 3a28
4063500 302c 3432 293d 2a28 302c 3433 293d 6628 302c 3335 292c 302c 3332 3b61 7267 5f5f 3130 736d 616e 6970 5f69 6e74 3a28 302c
4063560 3129 2c33 322c 3332 3b3b 0073 6d61 6e69 705f 696e 743a 5a63 736d 616e 6970 5f69 6e74 3b3b 5f5f 6174 5f5f 3130 736d 616e
4063640 6970 5f69 6e74 4650 4652 3369 6f73 695f 5233 696f 7369 203b 3b5f 5f6c 735f 5f46 5237 6f73 7472 6561 6d52 3130 736d 616e
4063720 6970 5f69 6e74 205f 5f72 735f 5f46 5237 6973 7472 6561 6d52 3130 736d 616e 6970 5f69 6e74 203b 0073 6170 706c 795f 696e
4064000 743a 5428 302c 3434 293d 7334 6663 745f 5f31 3073 6170 706c 795f 696e 743a 2830 2c34 3229 2c30 2c33 323b 3b00 7361 7070
4064060 6c79 5f69 6e74 3a5a 6373 6170 706c 795f 696e 743b 3b5f 5f63 745f 5f31 3073 6170 706c 795f 696e 7446 5046 5233 696f 7369
4064140 5f52 3369 6f73 205f 5f63 6c5f 5f31 3073 6170 706c 795f 696e 7446 6920 3b3b 3b00 696d 616e 6970 5f69 6e74 3a54 2830 2c34
4064220 3529 3d73 3866 6374 5f5f 3130 696d 616e 6970 5f69 6e74 3a28 302c 3436 293d 2a28 302c 3437 293d 6628 302c 3438 293d 2a28
4064300 302c 3334 292c 302c 3332 3b61 7267 5f5f 3130 696d 616e 6970 5f69 6e74 3a28 302c 3129 2c33 322c 3332 3b3b 0069 6d61 6e69
4064360 705f 696e 743a 5a63 696d 616e 6970 5f69 6e74 3b3b 5f5f 6374 5f5f 3130 696d 616e 6970 5f69 6e74 4650 4652 3769 7374 7265
4064440 616d 695f 5237 6973 7472 6561 6d69 203b 3b5f 5f72 735f 5f46 5237 6973 7472 6561 6d52 3130 696d 616e 6970 5f69 6e74 203b
4064520 0069 6170 706c 795f 696e 743a 5428 302c 3439 293d 7334 6663 745f 5f31 3069 6170 706c 795f 696e 743a 2830 2c34 3629 2c30
4064600 2c33 323b 3b00 6961 7070 6c79 5f69 6e74 3a5a 6369 6170 706c 795f 696e 743b 3b5f 5f63 745f 5f31 3069 6170 706c 795f 696e
4064660 7446 5046 5237 6973 7472 6561 6d69 5f52 3769 7374 7265 616d 205f 5f63 6c5f 5f31 3069 6170 706c 795f 696e 7446 6920 3b3b
4064740 3b00 6f6d 616e 6970 5f69 6e74 3a54 2830 2c35 3029 3d73 3866 6374 5f5f 3130 6f6d 616e 6970 5f69 6e74 3a28 302c 3531 293d
4065020 2a28 302c 3532 293d 6628 302c 3336 292c 302c 3332 3b61 7267 5f5f 3130 6f6d 616e 6970 5f69 6e74 3a28 302c 3129 2c33 322c
4065100 3332 3b3b 006f 6d61 6e69 705f 696e 743a 5a63 6f6d 616e 6970 5f69 6e74 3b3b 5f5f 6374 5f5f 3130 6f6d 616e 6970 5f69 6e74
4065160 4650 4652 376f 7374 7265 616d 695f 5237 6f73 7472 6561 6d69 203b 3b5f 5f6c 735f 5f46 5237 6f73 7472 6561 6d52 3130 6f6d
4065240 616e 6970 5f69 6e74 203b 006f 6170 706c 795f 696e 743a 5428 302c 3533 293d 7334 6663 745f 5f31 306f 6170 706c 795f 696e
4065320 743a 2830 2c35 3129 2c30 2c33 323b 3b00 6f61 7070 6c79 5f69 6e74 3a5a 636f 6170 706c 795f 696e 743b 3b5f 5f63 745f 5f31
4065400 306f 6170 706c 795f 696e 7446 5046 5237 6f73 7472 6561 6d69 5f52 376f 7374 7265 616d 205f 5f63 6c5f 5f31 306f 6170 706c
4065460 795f 696e 7446 6920 3b3b 3b00 696f 6d61 6e69 705f 696e 743a 5428 302c 3534 293d 7338 6663 745f 5f31 3169 6f6d 616e 6970
4065540 5f69 6e74 3a28 302c 3535 293d 2a28 302c 3536 293d 6628 302c 3537 293d 2a28 302c 3337 292c 302c 3332 3b61 7267 5f5f 3131
4065620 696f 6d61 6e69 705f 696e 743a 2830 2c31 292c 3332 2c33 323b 3b00 696f 6d61 6e69 705f 696e 743a 5a63 696f 6d61 6e69 705f
4065700 696e 743b 3b5f 5f63 745f 5f31 3169 6f6d 616e 6970 5f69 6e74 4650 4652 3869 6f73 7472 6561 6d69 5f52 3869 6f73 7472 6561
4065760 6d69 203b 3b5f 5f6c 735f 5f46 5238 696f 7374 7265 616d 5231 3169 6f6d 616e 6970 5f69 6e74 205f 5f72 735f 5f46 5238 696f
4066040 7374 7265 616d 5231 3169 6f6d 616e 6970 5f69 6e74 203b 0069 6f61 7070 6c79 5f69 6e74 3a54 2830 2c35 3829 3d73 3466 6374
4066120 5f5f 3131 696f 6170 706c 795f 696e 743a 2830 2c35 3529 2c30 2c33 323b 3b00 696f 6170 706c 795f 696e 743a 5a63 696f 6170
4066200 706c 795f 696e 743b 3b5f 5f63 745f 5f31 3169 6f61 7070 6c79 5f69 6e74 4650 4652 3869 6f73 7472 6561 6d69 5f52 3869 6f73
4066260 7472 6561 6d20 5f5f 636c 5f5f 3131 696f 6170 706c 795f 696e 7446 6920 3b3b 3b00 736d 616e 6970 5f6c 6f6e 673a 5428 302c
4066340 3539 293d 7338 6663 745f 5f31 3173 6d61 6e69 705f 6c6f 6e67 3a28 302c 3432 292c 302c 3332 3b61 7267 5f5f 3131 736d 616e
4066420 6970 5f6c 6f6e 673a 2830 2c31 292c 3332 2c33 323b 3b00 736d 616e 6970 5f6c 6f6e 673a 5a63 736d 616e 6970 5f6c 6f6e 673b
4066500 3b5f 5f63 745f 5f31 3173 6d61 6e69 705f 6c6f 6e67 4650 4652 3369 6f73 6c5f 5233 696f 736c 203b 3b5f 5f6c 735f 5f46 5237
4066560 6f73 7472 6561 6d52 3131 736d 616e 6970 5f6c 6f6e 6720 5f5f 7273 5f5f 4652 3769 7374 7265 616d 5231 3173 6d61 6e69 705f
4066640 6c6f 6e67 203b 0073 6170 706c 795f 6c6f 6e67 3a54 2830 2c36 3029 3d73 3466 6374 5f5f 3131 7361 7070 6c79 5f6c 6f6e 673a
4066720 2830 2c34 3229 2c30 2c33 323b 3b00 7361 7070 6c79 5f6c 6f6e 673a 5a63 7361 7070 6c79 5f6c 6f6e 673b 3b5f 5f63 745f 5f31
4067000 3173 6170 706c 795f 6c6f 6e67 4650 4652 3369 6f73 6c5f 5233 696f 7320 5f5f 636c 5f5f 3131 7361 7070 6c79 5f6c 6f6e 6746
4067060 6c20 3b3b 3b00 696d 616e 6970 5f6c 6f6e 673a 5428 302c 3631 293d 7338 6663 745f 5f31 3169 6d61 6e69 705f 6c6f 6e67 3a28
4067140 302c 3436 292c 302c 3332 3b61 7267 5f5f 3131 696d 616e 6970 5f6c 6f6e 673a 2830 2c31 292c 3332 2c33 323b 3b00 696d 616e
4067220 6970 5f6c 6f6e 673a 5a63 696d 616e 6970 5f6c 6f6e 673b 3b5f 5f63 745f 5f31 3169 6d61 6e69 705f 6c6f 6e67 4650 4652 3769
4067300 7374 7265 616d 6c5f 5237 6973 7472 6561 6d6c 203b 3b5f 5f72 735f 5f46 5237 6973 7472 6561 6d52 3131 696d 616e 6970 5f6c
4067360 6f6e 6720 3b00 6961 7070 6c79 5f6c 6f6e 673a 5428 302c 3632 293d 7334 6663 745f 5f31 3169 6170 706c 795f 6c6f 6e67 3a28
4067440 302c 3436 292c 302c 3332 3b3b 0069 6170 706c 795f 6c6f 6e67 3a5a 6369 6170 706c 795f 6c6f 6e67 3b3b 5f5f 6374 5f5f 3131

| | | | | | | | | | | | | | | | | | | | | | | | | |
|---|---|---|---|---|---|---|---|---|---|---|---|---|---|---|---|---|---|---|---|---|---|---|---|---|
| 4067520 | 6961 | 7070 | 6c79 | 5f6c | 6f6e | 6746 | 5046 | 5237 | 6973 | 7472 | 6561 | 6d6c | 5f52 | 3769 | 7374 | 7265 | 616d | 205f | 5f63 | 6c5f | 5f31 | 3169 | 6170 | 706c |
| 4067600 | 795f | 6c6f | 6e67 | 466c | 203b | 3b3b | 006f | 6d61 | 6e69 | 705f | 6c6f | 6e67 | 3a54 | 2830 | 2c36 | 3329 | 3d73 | 3866 | 6374 | 5f5f | 3131 | 6f6d | 616e | 6970 |
| 4067660 | 5f6c | 6f6e | 673a | 2830 | 2c35 | 3129 | 2c30 | 2c33 | 323b | 6172 | 675f | 5f31 | 316f | 6d61 | 6e69 | 705f | 6c6f | 6e67 | 3a28 | 302c | 3129 | 2c33 | 322c | 3332 |
| 4067740 | 3b3b | 006f | 6d61 | 6e69 | 705f | 6c6f | 6e67 | 3a5a | 636f | 6161 | 6e69 | 705f | 6c6f | 6e67 | 3b3b | 5f5f | 6374 | 5f5f | 3131 | 6f6d | 616e | 6970 | 5f6c | 6f6e |
| 4070020 | 6746 | 5046 | 5237 | 6f73 | 7472 | 6561 | 6d6c | 5f52 | 376f | 7374 | 7265 | 616d | 6c20 | 3b3b | 5f5f | 6c73 | 5f5f | 4652 | 376f | 7374 | 7265 | 616d | 5231 | 316f |
| 4070100 | 6461 | 6e69 | 705f | 6c6f | 6e67 | 203b | 006f | 6170 | 706c | 795f | 6c6f | 6e67 | 3a54 | 2830 | 2c36 | 3429 | 3d73 | 3466 | 6374 | 5f5f | 3131 | 6f61 | 7070 | 6c79 |
| 4070160 | 5f6c | 6f6e | 673a | 2830 | 2c35 | 3129 | 2c30 | 2c33 | 323b | 3b00 | 6f61 | 7070 | 6c79 | 5f6c | 6f6e | 673a | 5a63 | 6f61 | 7070 | 6c79 | 5f6c | 6f6e | 673b | 3b5f |
| 4070240 | 5f63 | 745f | 5f31 | 316f | 6170 | 706c | 795f | 6c6f | 6e67 | 4650 | 4652 | 376f | 7374 | 7265 | 616d | 6c5f | 5237 | 6f73 | 7472 | 6561 | 6d20 | 5f5f | 636c | 5f5f |
| 4070320 | 3131 | 6f61 | 7070 | 6c79 | 5f6c | 6f6e | 6746 | 6c20 | 3b3b | 3b00 | 696f | 6d61 | 6e69 | 705f | 6c6f | 6e67 | 3a54 | 2830 | 2c36 | 3529 | 3d73 | 3866 | 6374 | 5f5f |
| 4070400 | 3132 | 696f | 6d61 | 6e69 | 705f | 6c6f | 6e67 | 3a28 | 302c | 3535 | 292c | 302c | 3332 | 3b61 | 7267 | 5f5f | 3132 | 696f | 6d61 | 6e69 | 705f | 6c6f | 6e67 | 3a28 |
| 4070460 | 302c | 3129 | 2c33 | 322c | 3332 | 3b3b | 0069 | 6f6d | 616e | 6970 | 5f6c | 6f6e | 673a | 5a63 | 696f | 6d61 | 6e69 | 705f | 6c6f | 6e67 | 3b3b | 5f5f | 6374 | 5f5f |
| 4070540 | 3132 | 696f | 6d61 | 6e69 | 705f | 6c6f | 6e67 | 4650 | 4652 | 3869 | 6f73 | 7472 | 6561 | 6d6c | 5f52 | 3869 | 6f73 | 7472 | 6561 | 6d6c | 203b | 3b5f | 5f6c | 735f |
| 4070620 | 5f46 | 5238 | 636f | 7374 | 7265 | 616d | 5231 | 3269 | 6f6d | 616e | 6970 | 5f6c | 6f6e | 6720 | 5f5f | 7273 | 5f5f | 4652 | 3869 | 6f73 | 7472 | 6561 | 6d52 | 3132 |
| 4070700 | 696f | 6d61 | 6e69 | 705f | 6c6f | 6e67 | 203b | 0069 | 6f61 | 7070 | 6c79 | 5f6c | 6f6e | 673a | 5428 | 302c | 3636 | 293d | 7334 | 6663 | 745f | 5f31 | 3269 | 6f61 |
| 4070760 | 7070 | 6c79 | 5f6c | 6f6e | 673a | 2830 | 2c35 | 3529 | 2c30 | 2c33 | 323b | 3b00 | 696f | 6170 | 706c | 795f | 6c6f | 6e67 | 3a5a | 6369 | 6f61 | 7070 | 6c79 | 5f6c |
| 4071040 | 6f6e | 673b | 3b5f | 5f63 | 745f | 5f31 | 3269 | 6f61 | 7070 | 6c79 | 5f6c | 6f6e | 6746 | 5046 | 5238 | 696f | 7374 | 7265 | 616d | 6c5f | 5238 | 696f | 7374 | 7265 |
| 4071120 | 616d | 205f | 5f63 | 6c5f | 5f31 | 3269 | 6f61 | 7070 | 6c79 | 5f6c | 6f6e | 6746 | 6c20 | 3b3b | 3b00 | 7374 | 6469 | 6f62 | 7566 | 3a54 | 2830 | 2c36 | 3729 | 3d73 |
| 4071200 | 3532 | 616c | 6c6f | 635f | 5f39 | 7374 | 7265 | 616d | 6275 | 663a | 2830 | 2c34 | 292c | 302c | 3136 | 3b78 | 5f75 | 6e62 | 7566 | 5f5f | 3973 | 7472 | 6561 | 6d62 |
| 4071260 | 7566 | 3a28 | 302c | 3429 | 2c31 | 362c | 3136 | 3b78 | 5f62 | 6173 | 655f | 5f39 | 7374 | 7265 | 616d | 6275 | 663a | 2830 | 2c32 | 3029 | 2c33 | 322c | 3332 | 3b78 |
| 4071340 | 5f70 | 6261 | 7365 | 5f5f | 3973 | 7472 | 6561 | 6d62 | 7566 | 3a28 | 302c | 3230 | 292c | 3634 | 2c33 | 323b | 785f | 7070 | 7472 | 5f5f | 3973 | 7472 | 6561 | 6d62 |
| 4071420 | 7566 | 3a28 | 302c | 3230 | 292c | 3936 | 2c33 | 323b | 785f | 6570 | 7074 | 725f | 5f39 | 7374 | 7265 | 616d | 6275 | 663a | 2830 | 2c32 | 3029 | 2c31 | 3238 | 2c33 |
| 4071500 | 323b | 785f | 6770 | 7472 | 5f5f | 3973 | 7472 | 6561 | 6d62 | 7566 | 3a28 | 302c | 3230 | 292c | 3136 | 302c | 3332 | 3b78 | 5f65 | 6770 | 7472 | 5f5f | 3973 | 7472 |
| 4071560 | 6561 | 6d62 | 7566 | 3a28 | 302c | 3230 | 292c | 3139 | 322c | 3332 | 3b5c | 0078 | 5f65 | 6261 | 636b | 5f5f | 3973 | 7472 | 6561 | 6d62 | 7566 | 3a28 | 302c | 3230 |
| 4071640 | 292c | 3232 | 342c | 3332 | 3b78 | 5f62 | 6c65 | 6e5f | 5f39 | 7374 | 7265 | 616d | 6275 | 663a | 2830 | 2c31 | 292c | 3235 | 362c | 3332 | 3b5f | 5f76 | 7074 | 725f |
| 4071720 | 5f39 | 7374 | 7265 | 616d | 6275 | 663a | 2830 | 2c33 | 3329 | 2c32 | 3838 | 2c33 | 323b | 6670 | 5f5f | 3873 | 7464 | 696f | 6275 | 663a | 2830 | 2c36 | 3829 | 3d2a |
| 4072000 | 2830 | 2c31 | 3829 | 3d78 | 735f | 696f | 6275 | 663a | 2c33 | 3230 | 2c33 | 323b | 6c61 | 7374 | 5f6f | 705f | 5f38 | 7374 | 6469 | 6f62 | 7566 | 3a28 | 302c | 3129 |
| 4072060 | 2c33 | 3532 | 2c33 | 323b | 6275 | 665f | 5f38 | 7374 | 6469 | 6f62 | 7566 | 3a28 | 302c | 3639 | 293d | 6172 | 2830 | 2c31 | 293b | 303b | 313b | 2830 | 2c32 | 292c |
| 4072140 | 3338 | 342c | 3136 | 3b3b | 0073 | 7464 | 696f | 6275 | 663a | 5a63 | 7374 | 6469 | 6f62 | 7566 | 3b73 | 7472 | 6561 | 6d62 | 7566 | 3b6f | 7665 | 7266 | 6c6f | 775f |
| 4072220 | 5f38 | 7374 | 6469 | 6f62 | 7566 | 4669 | 2075 | 6e64 | 6572 | 666c | 6f77 | 5f5f | 3873 | 7464 | 696f | 6275 | 6646 | 7620 | 7379 | 6e63 | 5f5f | 3873 | 7464 | 696f |
| 4072300 | 6275 | 6646 | 7620 | 7365 | 656b | 6166 | 665f | 5f38 | 7374 | 6469 | 6f62 | 7566 | 466c | 3873 | 6565 | 6b5f | 6469 | 7269 | 2070 | 6261 | 636b | 6661 | 696c | 5f5f |
| 4072360 | 3873 | 7464 | 696f | 6275 | 6646 | 6920 | 5f5f | 6374 | 5f5f | 3873 | 7464 | 696f | 6275 | 6646 | 5036 | 5f69 | 6f62 | 7566 | 205f | 5f63 | 745f | 5f38 | 7374 | 6469 |
| 4072440 | 6f62 | 7566 | 4652 | 4338 | 7374 | 6469 | 6f62 | 7566 | 205c | 0073 | 7464 | 696f | 6669 | 6c65 | 5f5f | 3873 | 7464 | 696f | 6275 | 6646 | 7620 | 5f5f | 6474 | 5f5f |
| 4072520 | 3873 | 7464 | 696f | 6275 | 6646 | 7620 | 3b3b | 3b00 | 6669 | 6c65 | 6275 | 663a | 5428 | 302c | 3730 | 293d | 7336 | 3461 | 6c6c | 6f63 | 5f5f | 3973 | 7472 | 6561 |
| 4072600 | 6d62 | 7566 | 3a28 | 302c | 3429 | 2c30 | 2c31 | 363b | 785f | 756e | 6275 | 665f | 5f39 | 7374 | 7265 | 616d | 6275 | 663a | 2830 | 2c34 | 292c | 3136 | 2c31 | 363b |
| 4072660 | 785f | 6261 | 7365 | 5f5f | 3973 | 7472 | 6561 | 6d62 | 7566 | 3a28 | 302c | 3230 | 292c | 3332 | 2c33 | 323b | 785f | 7062 | 6173 | 655f | 5f39 | 7374 | 7265 | 616d |
| 4072740 | 6275 | 663a | 2830 | 2c32 | 3029 | 2c36 | 342c | 3332 | 3b78 | 5f70 | 7074 | 725f | 5f39 | 7374 | 7265 | 616d | 6275 | 663a | 2830 | 2c32 | 3029 | 2c39 | 362c | 3332 |
| 4073020 | 3b78 | 5f65 | 7070 | 7472 | 5f5f | 3973 | 7472 | 6561 | 6d62 | 7566 | 3a28 | 302c | 3230 | 292c | 3132 | 382c | 3332 | 3b78 | 5f67 | 7074 | 725f | 5f39 | 7374 | 7265 |
| 4073100 | 616d | 6275 | 663a | 2830 | 2c32 | 3029 | 2c31 | 3630 | 2c33 | 323b | 785f | 6567 | 7074 | 725f | 5f39 | 7374 | 7265 | 616d | 6275 | 663a | 2830 | 2c32 | 3029 | 2c31 |
| 4073160 | 3932 | 2c33 | 323b | 5c00 | 785f | 6562 | 6163 | 6b5f | 5f39 | 7374 | 7265 | 616d | 6275 | 663a | 2830 | 2c32 | 3029 | 2c32 | 3234 | 2c33 | 323b | 785f | 626c | 656e |
| 4073240 | 5f5f | 3973 | 7472 | 6561 | 6d62 | 7566 | 3a28 | 302c | 3129 | 2c32 | 3536 | 2c33 | 323b | 5f5f | 7670 | 7472 | 5f5f | 3973 | 7472 | 6561 | 6d62 | 7566 | 3a28 | 302c |
| 4073320 | 3333 | 292c | 3238 | 382c | 3332 | 3b79 | 6664 | 5f5f | 3766 | 696c | 6562 | 7566 | 3a28 | 302c | 3129 | 2c33 | 3230 | 2c33 | 323b | 646f | 6465 | 5f5f | 3766 | 696c |
| 4073400 | 6562 | 7566 | 3a28 | 302c | 3129 | 2c33 | 3532 | 2c33 | 323b | 6f70 | 656e | 6564 | 5f5f | 3766 | 696c | 6562 | 7566 | 3a28 | 302c | 3229 | 2c33 | 3834 | 2c38 | 3b6c |
| 4073460 | 6173 | 745f | 7365 | 656b | 5f5f | 3766 | 696c | 6562 | 7566 | 3a28 | 302c | 3129 | 2c34 | 3136 | 2c33 | 323b | 696e | 5f73 | 7461 | 7274 | 5f5f | 3766 | 696c | 6562 |
| 4073540 | 7566 | 3a28 | 302c | 3230 | 292c | 3434 | 382c | 3332 | 3b6c | 6168 | 6561 | 645f | 5f37 | 6669 | 6c65 | 6275 | 663a | 2830 | 2c36 | 3929 | 2c34 | 3830 | 2c31 | 363b |
| 4073620 | 3b00 | 6f70 | 656e | 7072 | 6f74 | 5f5f | 3766 | 696c | 6562 | 7566 | 3a47 | 2830 | 2c31 | 2900 | 6669 | 6c65 | 6275 | 663a | 5a63 | 6669 | 6c65 | 6275 | 663b | 7374 |
| 4073700 | 7265 | 616d | 6275 | 663b | 5f5f | 6374 | 5f5f | 3766 | 696c | 6562 | 7566 | 4676 | 205f | 5f63 | 745f | 5f37 | 6669 | 6c65 | 6275 | 6646 | 6920 | 5f5f | 6374 | 5f5f |
| 4073760 | 3766 | 696c | 6562 | 7566 | 4669 | 5063 | 5431 | 205f | 5f63 | 745f | 5f37 | 6669 | 6c65 | 6275 | 6646 | 5243 | 3766 | 696c | 6562 | 7566 | 2069 | 735f | 6f70 | 656e |
| 4074040 | 5f5f | 3766 | 696c | 6562 | 7566 | 4676 | 2366 | 645f | 5f37 | 6669 | 6c65 | 6275 | 6646 | 7620 | 6f70 | 656e | 5f5f | 3766 | 696c | 6562 | 7566 | 4650 | 4363 | 6954 |
| 4074120 | 3220 | 6174 | 7461 | 6368 | 5f5f | 3766 | 696c | 6562 | 7566 | 4669 | 2063 | 6c6f | 7365 | 5f5f | 3766 | 696c | 6562 | 7566 | 4676 | 205c | 005f | 5f64 | 745f | 5f37 |
| 4074200 | 6669 | 6c65 | 6275 | 6646 | 7620 | 6f76 | 6572 | 666c | 6f77 | 5f5f | 3766 | 696c | 6562 | 7566 | 4669 | 2075 | 6e64 | 6572 | 666c | 6f77 | 5f5f | 3766 | 696c | 6562 |
| 4074260 | 7566 | 4676 | 2073 | 796e | 635f | 5f37 | 6669 | 6c65 | 6275 | 6646 | 7620 | 7365 | 656b | 6f66 | 665f | 5f37 | 6669 | 6c65 | 6275 | 6646 | 6c38 | 7365 | 656b | 5f64 |
| 4074340 | 6972 | 6920 | 7365 | 7462 | 7566 | 5f5f | 3766 | 696c | 6562 | 7566 | 4650 | 6369 | 206c | 6173 | 745f | 6f70 | 5f5f | 3766 | 696c | 6562 | 7566 | 4676 | 203b | 6f70 |
| 4074420 | 656e | 7072 | 6f74 | 5f5f | 3766 | 696c | 6562 | 7566 | 203b | 3b00 | 6673 | 7472 | 6561 | 6d62 | 6173 | 653a | 5428 | 302c | 3731 | 293d | 7331 | 3332 | 6275 | 665f |
| 4074500 | 5f31 | 3166 | 7374 | 7265 | 616d | 6261 | 7365 | 3a28 | 302c | 3730 | 292c | 302c | 3531 | 323b | 5f5f | 7670 | 7472 | 5f5f | 3131 | 6673 | 7472 | 6561 | 6d62 | 6173 |
| 4074560 | 653a | 2830 | 2c33 | 3329 | 2c35 | 3132 | 2c33 | 323b | 5069 | 6f73 | 3a28 | 302c | 3335 | 292c | 3534 | 342c | 3332 | 3b4f | 696f | 733a | 2830 | 2c32 | 3629 | 2c35 |

| | | | | | | | | | | | | | | | | | | | | | | | | |
|---|---|---|---|---|---|---|---|---|---|---|---|---|---|---|---|---|---|---|---|---|---|---|---|---|
| 4074640 | 3736 | 2c34 | 3830 | 3b3b | 0066 | 7374 | 7265 | 616d | 6261 | 7365 | 3a5a | 6366 | 7374 | 7265 | 616d | 6261 | 7365 | 3b69 | 6f73 | 3b5f | 5f63 | 745f | 5f31 | 3166 |
| 4074720 | 7374 | 7265 | 616d | 6261 | 7365 | 4676 | 205f | 5f63 | 745f | 5f31 | 3166 | 7374 | 7265 | 616d | 6261 | 7365 | 4650 | 4363 | 6954 | 3220 | 5f5f | 6374 | 5f5f | 3131 |
| 4075000 | 6673 | 7472 | 6561 | 6d62 | 6173 | 6546 | 6920 | 5f5f | 6374 | 5f5f | 3131 | 6673 | 7472 | 6561 | 6d62 | 6173 | 6546 | 6950 | 6354 | 3120 | 5f5f | 6374 | 5f5f | 3131 |
| 4075060 | 6673 | 7472 | 6561 | 6462 | 6173 | 6546 | 5231 | 3166 | 7374 | 7265 | 616d | 6261 | 7365 | 205f | 5f64 | 745f | 5f31 | 3166 | 7374 | 7265 | 616d | 6261 | 7365 | 4676 |
| 4075140 | 206f | 7065 | 6e5f | 5f31 | 3166 | 7374 | 7265 | 616d | 6261 | 7365 | 4650 | 4363 | 6954 | 3220 | 5c00 | 6174 | 7461 | 6368 | 5f5f | 3131 | 6673 | 7472 | 6561 | 6d62 |
| 4075220 | 6173 | 6546 | 6920 | 636c | 6f73 | 655f | 5f31 | 3166 | 7374 | 7265 | 616d | 6261 | 7365 | 4676 | 2073 | 6574 | 6275 | 665f | 5f31 | 3166 | 7374 | 7265 | 616d | 6261 |
| 4075300 | 7365 | 4650 | 6369 | 2072 | 6462 | 7566 | 5f5f | 3131 | 6673 | 7472 | 6561 | 6d62 | 6173 | 6546 | 7620 | 7665 | 7269 | 6679 | 5f5f | 3131 | 6673 | 7472 | 6561 | 6d62 |
| 4075360 | 6173 | 6546 | 6920 | 3b3b | 3b00 | 7374 | 6174 | 655f | 7661 | 6c75 | 653a | 7428 | 302c | 3231 | 2900 | 5661 | 6c75 | 655f | 5479 | 7065 | 3a54 | 2830 | 2c37 | 3229 |
| 4075440 | 3d65 | 554e | 4b4e | 4f57 | 4e56 | 3a30 | 2c53 | 5452 | 494e | 473a | 312c | 494e | 5445 | 4745 | 523a | 322c | 464c | 4f41 | 543a | 332c | 3b00 | 426c | 6f63 | 6b5f |
| 4075520 | 5479 | 7065 | 3a54 | 2830 | 2c37 | 3329 | 3d65 | 554e | 4b4e | 4f57 | 4e42 | 3a30 | 2c45 | 4e54 | 4954 | 593a | 312c | 4655 | 4e43 | 5449 | 4f4e | 3a32 | 2c50 | 524f |
| 4075600 | 4345 | 4455 | 5245 | 3a33 | 2c3b | 0045 | 6e74 | 6974 | 795f | 5479 | 7065 | 3a54 | 2830 | 2c37 | 3429 | 3d65 | 554e | 4b4e | 4f57 | 4e45 | 3a30 | 2c41 | 5243 | 4849 |
| 4075660 | 5445 | 4354 | 5552 | 453a | 312c | 5355 | 4250 | 524f | 4752 | 414d | 3a32 | 2c3b | 0050 | 696e | 5f54 | 7970 | 653a | 5428 | 302c | 3735 | 293d | 6555 | 4e4b | 4e4f |
| 4075740 | 574e | 503a | 302c | 494e | 5049 | 4e3a | 312c | 4f55 | 5450 | 494e | 3a32 | 2c47 | 4e4f | 5554 | 5049 | 4e3a | 332c | 3b00 | 5061 | 7261 | 5f43 | 6c61 | 7373 | 3a54 |
| 4076020 | 2830 | 2c37 | 3629 | 3d65 | 554e | 4b4e | 4f57 | 4e43 | 3a30 | 2c46 | 4f52 | 4d41 | 4c3a | 312c | 4143 | 5455 | 414c | 3a32 | 2c52 | 4553 | 4f4c | 5645 | 443a | 332c |
| 4076100 | 3b00 | 424f | 4f4c | 4541 | 4e3a | 5428 | 302c | 3737 | 2931 | 6546 | 616c | 7365 | 3a30 | 2c54 | 7275 | 653a | 312c | 3b00 | 426f | 6f6c | 6561 | 6e3a | 5428 | 302c |
| 4076160 | 3738 | 293d | 6566 | 616c | 7365 | 3a30 | 2c74 | 7275 | 653a | 312c | 3b00 | 4275 | 6666 | 6572 | 3a47 | 2830 | 2c32 | 3029 | 004f | 626a | 6563 | 743a | 5428 | 302c |
| 4076240 | 3739 | 293d | 7334 | 5f5f | 7670 | 7472 | 5f5f | 364f | 626a | 6563 | 743a | 2830 | 2c33 | 3329 | 2c30 | 2c33 | 323b | 3b00 | 4f62 | 6a65 | 6374 | 3a5a | 634f | 626a |
| 4076320 | 6563 | 743b | 3b5f | 5f63 | 745f | 5f36 | 4f62 | 6a65 | 6374 | 4676 | 205f | 5f63 | 745f | 5f36 | 4f62 | 6a65 | 6374 | 4652 | 4336 | 4f62 | 6a65 | 6374 | 2065 | 7272 |
| 4076400 | 6f72 | 4d65 | 6d6f | 7279 | 5f5f | 364f | 626a | 6563 | 7446 | 5063 | 5431 | 2065 | 7870 | 6c61 | 696e | 5f5f | 364f | 626a | 6563 | 7446 | 5063 | 2069 | 6e4f | 7264 |
| 4076460 | 6572 | 5f5f | 364f | 626a | 6563 | 7446 | 5036 | 4f62 | 6a65 | 6374 | 203b | 3b3b | 005f | 5f70 | 7462 | 6c5f | 5f36 | 4f62 | 6a65 | 6374 | 5f5f | 4669 | 666f | 5f63 |
| 4076540 | 7878 | 3a47 | 2830 | 2c33 | 3329 | 0050 | 463a | 7428 | 302c | 3135 | 2900 | 5046 | 433a | 7428 | 302c | 3135 | 2900 | 5046 | 493a | 7428 | 302c | 3135 | 2900 | 4e4f |
| 4076620 | 626a | 6563 | 743a | 5428 | 302c | 3830 | 293d | 7338 | 5f5f | 7670 | 7472 | 5f5f | 364f | 626a | 6563 | 743a | 2830 | 2c33 | 3329 | 2c30 | 2c33 | 323b | 6e61 | 6d65 |
| 4076700 | 5f5f | 374e | 4f62 | 6a65 | 6374 | 3a28 | 302c | 3230 | 292c | 3332 | 2c33 | 323b | 3b00 | 4e4f | 626a | 6563 | 743a | 5a63 | 4e4f | 626a | 6563 | 743b | 4f62 | 6a65 |
| 4076760 | 6374 | 3b5f | 5f63 | 745f | 5f37 | 4e4f | 626a | 6563 | 7446 | 5063 | 205f | 5f63 | 745f | 5f37 | 4e4f | 626a | 6563 | 7446 | 5243 | 374e | 4f62 | 6a65 | 6374 | 2073 |
| 4077040 | 6574 | 4e61 | 6d65 | 5f5f | 374e | 4f62 | 6a65 | 6374 | 4650 | 6320 | 6765 | 744e | 616d | 655f | 5f37 | 4e4f | 626a | 6563 | 7446 | 7620 | 6578 | 736c | 6169 | 6e5f |
| 4077120 | 5f37 | 4e4f | 626a | 6563 | 7446 | 5063 | 2067 | 6574 | 4174 | 7472 | 5f5f | 374e | 4f62 | 6a65 | 6374 | 4669 | 2067 | 6574 | 5072 | 6f70 | 5f5f | 374e | 4f62 | 6a65 |
| 4077200 | 6374 | 4650 | 6369 | 2073 | 6574 | 5072 | 6f70 | 5f5f | 374e | 4f62 | 6a65 | 6374 | 4650 | 6354 | 3120 | 5c00 | 7365 | 7450 | 726f | 705f | 5f37 | 4e4f | 626a | 6563 |
| 4077260 | 7446 | 5063 | 6920 | 7365 | 7450 | 726f | 705f | 5f37 | 4e4f | 626a | 6563 | 7446 | 5063 | 6620 | 6973 | 4754 | 455f | 5f37 | 4e4f | 626a | 6563 | 7446 | 5036 | 4f62 |
| 4077340 | 6a65 | 6374 | 2069 | 734c | 5445 | 5f5f | 374e | 4f62 | 6a65 | 6374 | 4650 | 364f | 626a | 6563 | 7420 | 3b3b | 3b00 | 6f73 | 7472 | 6561 | 6d5f | 7769 | 7468 | 6173 |
| 4077420 | 7369 | 676e | 3a54 | 2830 | 2c33 | 3929 | 3473 | 3638 | 5f5f | 7670 | 7472 | 5f5f | 376f | 7374 | 7265 | 616d | 3a28 | 302c | 3333 | 292c | 302c | 3332 | 3b50 | 696f |
| 4077500 | 733a | 2830 | 2c33 | 3529 | 2c33 | 322c | 3332 | 3b4f | 696f | 733a | 2830 | 2c32 | 3629 | 2c36 | 342c | 3438 | 303b | 3b00 | 6f73 | 7472 | 6561 | 6d5f | 7769 | 7468 |
| 4077560 | 6173 | 7369 | 676e | 3a5a | 636f | 7374 | 7265 | 616d | 5f77 | 6974 | 6861 | 7373 | 6967 | 6e3b | 6f73 | 7472 | 6561 | 6d20 | 696f | 733b | 5f5f | 6374 | 5f5f | 3138 |
| 4077640 | 6f73 | 7472 | 6561 | 6d5f | 7769 | 7468 | 6173 | 7369 | 676e | 4676 | 205f | 5f63 | 745f | 5f31 | 386f | 7374 | 7265 | 616d | 5f77 | 6974 | 6861 | 7373 | 6967 | 6e46 |
| 4077720 | 5231 | 386f | 7374 | 7265 | 616d | 5f77 | 6974 | 6861 | 7373 | 6967 | 6e20 | 5f5f | 6474 | 5f5f | 3138 | 6f73 | 7472 | 6561 | 6d5f | 7769 | 7468 | 6173 | 7369 | 676e |
| 4100000 | 4676 | 205f | 5f61 | 735f | 5f31 | 386f | 7374 | 7265 | 616d | 5f77 | 6974 | 6861 | 7373 | 6967 | 6e46 | 5237 | 6f73 | 7472 | 6561 | 6320 | 5c00 | 5f5f | 6173 | 5f5f |
| 4100060 | 3138 | 6f73 | 7472 | 6561 | 6d5f | 7769 | 7468 | 6173 | 7369 | 676e | 4650 | 3973 | 7472 | 6561 | 6d62 | 7566 | 203b | 3b3b | 0050 | 4642 | 3a74 | 2830 | 2c31 | 3529 |
| 4100140 | 004c | 4e4f | 626a | 6563 | 743a | 5428 | 302c | 3831 | 293d | 7331 | 325f | 5f76 | 7074 | 725f | 5f36 | 4f62 | 6a65 | 6374 | 3a28 | 302c | 3333 | 292c | 302c | 3332 |
| 4100220 | 3b6e | 616d | 655f | 5f37 | 4e4f | 626a | 6563 | 743a | 2830 | 2c32 | 3029 | 2c33 | 322c | 3332 | 3b6e | 6578 | 745f | 5f38 | 4c4e | 4f62 | 6a65 | 6374 | 3a28 | 302c |
| 4100300 | 3832 | 293d | 2a28 | 302c | 3831 | 292c | 3634 | 2c33 | 323b | 3b00 | 4c4e | 4f62 | 6a65 | 6374 | 3a5a | 634c | 4e4f | 626a | 6563 | 743b | 4e4f | 626a | 6563 | 743b |
| 4100360 | 5f5f | 6374 | 5f5f | 384c | 4e4f | 626a | 6563 | 7446 | 5063 | 5038 | 4c4e | 4f62 | 6a65 | 6374 | 205f | 5f63 | 745f | 5f38 | 4c4e | 4f62 | 6a65 | 6374 | 4652 | 4338 |
| 4100440 | 4c4e | 4f62 | 6a65 | 6374 | 2073 | 6574 | 4e65 | 7874 | 5f5f | 384c | 4e4f | 626a | 6563 | 7446 | 5038 | 4c4e | 4f62 | 6a65 | 6374 | 2067 | 6574 | 4e65 | 7874 | 5f5f |
| 4100520 | 384c | 4e4f | 626a | 6563 | 7446 | 7620 | 3b3b | 3b00 | 4c4f | 626a | 6563 | 743a | 5428 | 302c | 3833 | 293d | 7338 | 5f5f | 7670 | 7472 | 5f5f | 364f | 626a | 6563 |
| 4100600 | 743a | 2830 | 2c33 | 3329 | 2c30 | 2c33 | 323b | 6e65 | 7874 | 5f5f | 374c | 4f62 | 6a65 | 6374 | 3a28 | 302c | 3834 | 293d | 2a28 | 302c | 3833 | 292c | 3332 | 2c33 |
| 4100660 | 323b | 3b00 | 4c4f | 626a | 6563 | 743a | 5a63 | 4c4f | 626a | 6563 | 743b | 4f62 | 6a65 | 6374 | 3b5f | 5f63 | 745f | 5f37 | 4c4f | 626a | 6563 | 7446 | 5037 | 4c4f |
| 4100740 | 626a | 6563 | 7420 | 5f5f | 6374 | 5f5f | 374c | 4f62 | 6a65 | 6374 | 4652 | 4337 | 4c4f | 626a | 6563 | 7420 | 7365 | 744e | 6578 | 745f | 5f37 | 4c4f | 626a | 6563 |
| 4101020 | 7446 | 5037 | 4c4f | 626a | 6563 | 7420 | 6765 | 744e | 6578 | 745f | 5f37 | 4c4f | 626a | 6563 | 7446 | 7620 | 3b3b | 3b00 | 4c50 | 4f62 | 6a65 | 6374 | 3a54 | 2830 |
| 4101100 | 2c38 | 3529 | 3d73 | 3132 | 5f5f | 7670 | 7472 | 5f5f | 364f | 626a | 6563 | 743a | 2830 | 2c33 | 3329 | 2c30 | 2c33 | 323b | 6e65 | 7874 | 5f5f | 374c | 4f62 | 6a65 |
| 4101160 | 6374 | 3a28 | 302c | 3834 | 292c | 3332 | 2c33 | 323b | 6e6f | 626a | 7074 | 725f | 5f38 | 4c50 | 4f62 | 6a65 | 6374 | 3a28 | 302c | 3936 | 293d | 2a28 | 302c | 3830 |
| 4101240 | 292c | 3634 | 2c33 | 323b | 3b00 | 4c50 | 4f62 | 6a65 | 6374 | 3a5a | 634c | 504f | 626a | 6563 | 743b | 4c4f | 626a | 6563 | 743b | 5f5f | 6374 | 5f5f | 384c | 504f |
| 4101320 | 626a | 6563 | 7446 | 5037 | 4e4f | 626a | 6563 | 7450 | 374c | 4f62 | 6a65 | 6374 | 205f | 5f63 | 745f | 5f38 | 4c50 | 4f62 | 6a65 | 6374 | 4652 | 4338 | 4c50 | 4f62 |
| 4101400 | 6a65 | 6374 | 2073 | 6574 | 4f62 | 6a65 | 6374 | 5f5f | 384c | 504f | 626a | 6563 | 7446 | 5037 | 4e4f | 626a | 6563 | 7420 | 6765 | 744f | 626a | 6563 | 745f | 5f38 |
| 4101460 | 4c50 | 4f62 | 6a65 | 6374 | 4676 | 2065 | 7870 | 6c61 | 696e | 5f5f | 384c | 504f | 626a | 6563 | 7446 | 5063 | 203b | 3b3b | 005f | 5f70 | 7462 | 6c5f | 5f38 | 4c50 |
| 4101540 | 4f62 | 6a65 | 6374 | 5f5f | 4669 | 666f | 5f63 | 7878 | 3a47 | 2830 | 2c33 | 3329 | 004c | 6973 | 743a | 5428 | 302c | 3837 | 293d | 7331 | 3263 | 6f75 | 6e74 | 5f5f |
| 4101620 | 344c | 6973 | 743a | 2830 | 2c31 | 292c | 302c | 3332 | 3b70 | 7472 | 4c4f | 626a | 6563 | 745f | 5f34 | 4c69 | 7374 | 3a28 | 302c | 3834 | 292c | 3332 | 2c33 | 323b |
| 4101700 | 5f5f | 7670 | 7472 | 5f5f | 344c | 6973 | 743a | 2830 | 2c33 | 3329 | 2c36 | 342c | 3332 | 3b3b | 004c | 6973 | 743a | 5a63 | 4c69 | 7374 | 3b3b | 5f5f | 6374 | 5f5f |

```
4101760 344c 6973 7446 7620 5f5f 6374 5f5f 344c 6973 7446 5243 344c 6973 7420 5f5f 6474 5f5f 344c 6973 7446 7620 6765 7443 6f75
4102040 6e74 5f5f 344c 6973 7446 7620 6765 7454 6f70 5f5f 344c 6973 7446 7620 7365 7454 6f70 5f5f 344c 6973 7446 5037 4c4f 626a
4102120 6563 7420 6572 726f 724d 656d 6f72 795f 5f34 4c69 7374 4650 6354 3120 6272 6f61 6463 6173 745f 5f34 4c69 7374 464d 364f
4102200 626a 6563 7446 765f 7620 6578 706c 6169 6e5f 5f34 4c69 7374 4650 6320 5c00 696e 7365 7274 5f5f 344c 6973 7446 5037 4c4f
4102260 626a 6563 7420 6973 4d65 6d62 6572 5f5f 344c 6973 7446 5037 4c4f 626a 6563 7420 6973 4d65 6d62 6572 5f5f 344c 6973 7446
4102340 5063 2069 7345 7175 616c 5f5f 344c 6973 7446 5234 4c69 7374 2072 656d 6f76 655f 5f34 4c69 7374 4650 6320 3b3b 3b00 5f5f
4102420 7374 626c 5f5f 344c 6973 745f 5f46 6366 6f5f 6378 783a 4728 302c 3333 2900 504c 6973 743a 5428 302c 3838 293d 7331 3263
4102500 6f75 6e74 5f5f 344c 6973 743a 2830 2c31 292c 302c 3332 3b70 7472 4c4f 626a 6563 745f 5f34 4c69 7374 3a28 302c 3834 292c
4102560 3332 2c33 323b 5f5f 7670 7472 5f5f 344c 6973 743a 2830 2c33 3329 2c36 342c 3332 3b3b 0050 4c69 7374 3a5a 6350 4c69 7374
4102640 3b4c 6973 743b 696e 7365 7274 5f5f 3550 4c69 7374 4650 384c 504f 626a 6563 7420 696e 7365 7274 5f5f 3550 4c69 7374 4652
4102720 3550 4c69 7374 2053 6f72 745f 504c 6973 745f 5f35 504c 6973 7446 6920 7265 7665 7273 655f 5f35 504c 6973 7446 7620 696e
4103000 7365 7274 4166 7465 725f 5f35 504c 6973 7446 5038 4c50 4f62 6a65 6374 5431 2072 656d 6f76 655f 5f35 504c 6973 7446 5038
4103060 4c50 4f62 6a65 6374 2072 656d 6f76 655f 5f35 504c 6973 7446 5063 2069 734d 656d 6265 725f 5f35 504c 6973 7446 5063 205c
4103140 0069 734d 656d 6265 725f 5f35 504c 6973 7446 5037 4c4f 626a 6563 7420 6973 4571 7561 6c5f 5f35 504c 6973 7446 5234 4c69
4103220 7374 2065 7870 6c61 696e 5f5f 3550 4c69 7374 4650 6320 5f5f 6374 5f5f 3550 4c69 7374 4652 4335 504c 6973 7420 5f5f 6374
4103300 5f5f 3550 4c69 7374 4676 203b 3b3b 005f 5f70 7462 6c5f 5f35 504c 6973 745f 5f46 6966 6f5f 6378 783a 4728 302c 3333 2900
4103360 4c69 7374 4974 6572 6174 6f72 3a54 2830 2c38 3929 3d73 386c 6973 745f 5f31 324c 6973 7449 7465 7261 746f 723a 2830 2c39
4103440 3029 3d2a 2830 2c38 3729 2c30 2c33 323b 705f 5f31 324c 6973 7449 7465 7261 746f 723a 2830 2c38 3429 2c33 322c 3332 3b3b
4103520 004c 6973 7449 7465 7261 746f 723a 5a63 4c69 7374 4974 6572 6174 6f72 3b3b 5f5f 6374 5f5f 3132 4c69 7374 4974 6572 6174
4103600 6f72 4652 344c 6973 7420 7265 7365 745f 5f31 324c 6973 7449 7465 7261 746f 7246 7620 6174 7461 6368 5f5f 3132 4c69 7374
4103660 4974 6572 6174 6f72 4652 344c 6973 7420 6765 7443 7572 7265 6e74 5f5f 3132 4c69 7374 4974 6572 6174 6f72 4676 205f 5f70
4103740 705f 5f31 324c 6973 7449 7465 7261 746f 7246 7620 3b3b 3b00 5069 6e4c 656e 6774 683a 5428 302c 3931 293d 7331 365f 5f76
4104020 7074 725f 5f36 4f62 6a65 6374 3a28 302c 3333 292c 302c 3332 3b6e 616d 655f 5f37 4e4f 626a 6563 743a 2830 2c32 3029 2c33
4104100 322c 3332 3b43 6c65 6e67 7468 5f5f 3950 696e 4c65 6e67 7468 3a28 302c 3230 292c 3638 2c33 323b 496c 656e 6774 685f 5f39
4104160 5069 6e4c 656e 6774 683a 2830 2c31 292c 3936 2c33 323b 3b00 5069 6e4c 656e 6774 683a 5a63 5069 6e4c 656e 6774 683b 4e4f
4104240 626a 6563 743b 5f5f 6374 5f5f 3950 696e 4c65 6e67 7468 4650 6354 3120 5f5f 6374 5f5f 3950 696e 4c65 6e67 7468 4652 4339
4104320 5069 6e4c 656e 6774 6820 7365 745f 5069 6e4c 656e 6774 685f 5f39 5069 6e4c 656e 6774 6846 5063 5431 2067 6574 5f49 5f50
4104400 696e 4c65 6e67 7468 5f5f 3950 696e 4c65 6e67 7468 4676 2067 6574 5f49 5f50 696e 4c65 6e67 7468 5f5f 3950 696e 4c65 6e67
4104460 7468 4669 203b 3b3b 004d 6f64 4765 6e3a 5428 302c 3932 293d 7332 3442 6974 5769 6474 685f 5f36 4d6f 6447 656e 3a28 302c
4104540 3129 2c30 2c33 323b 4553 7461 7465 5f5f 364d 6f64 4765 6e3a 2830 2c37 3829 2c33 322c 3332 3b50 696e 4e61 6d65 4c65 6e67
4104620 7468 5f5f 364d 6f64 4765 6e3a 2830 2c38 3829 2c36 342c 3936 3b5f 5f76 7074 725f 5f36 4d6f 6447 656e 3a28 302c 3333 292c
4104700 3136 302c 3332 3b3b 004d 6f64 4765 6e3a 5a63 4d6f 6447 656e 3b3b 5f5f 6374 5f5f 364d 6f64 4765 6e46 7620 5f5f 6374 5f5f
4104760 364d 6f64 4765 6e46 5243 364d 6f64 4765 6e20 7365 745f 4269 7457 6964 7468 5f5f 364d 6f64 4765 6e46 6920 7365 745f 4553
4105040 7461 7465 5f5f 364d 6f64 4765 6e46 3742 6f6f 6c65 616e 2067 6574 5f45 5374 6174 655f 5f36 4d6f 6447 656e 4676 2073 6574
4105120 5f50 696e 4c65 6e67 7468 5f5f 364d 6f64 4765 6e46 5063 5431 2067 6574 5f50 696e 4c65 6e67 7468 5f5f 364d 6f64 4765 6e46
4105200 5063 2073 6574 496e 6465 785f 5f36 4d6f 6447 656e 4676 205c 0073 6574 4e61 6d65 496e 6465 785f 5f36 4d6f 6447 656e 4650
4105260 6320 4c6f 6164 5f56 4844 4c5f 4461 7461 5f5f 364d 6f64 4765 6e46 5037 4e4f 626a 6563 7420 436f 6d70 6f73 655f 4d6f 6447
4105340 656e 5f44 6573 6372 6970 746f 725f 5f36 4d6f 6447 656e 4650 6320 6578 706c 6169 6e5f 5f36 4d6f 6447 656e 4676 205f 5f64
4105420 745f 5f36 4d6f 6447 656e 4676 203b 3b3b 005f 5f70 7462 6c5f 5f36 4d6f 6447 656e 5f5f 4669 666f 5f63 7878 3a47 2830 2c33
4105500 3329 0049 4f5f 4161 6e61 6765 723a 5428 302c 3933 293d 7333 3669 6670 5f5f 3130 494f 5f4d 616e 6167 6572 3a28 302c 3638
4105560 292c 302c 3332 3b6f 6670 5f5f 3130 494f 5f4d 616e 6167 6572 3a28 302c 3638 292c 3332 2c33 323b 6d66 705f 5f31 3049 4f5f
4105640 4d61 6e61 6765 723a 2830 2c36 3329 2c36 342c 3332 3b63 6670 5f5f 3130 494f 5f4d 616e 6167 6572 3a28 302c 3638 292c 3936
4105720 2c33 323b 4946 696c 654e 616d 655f 5f31 3049 4f5f 4d61 6e61 6765 723a 2830 2c32 3029 2c31 3238 2c33 323b 4f46 696c 654e
4106000 616d 655f 5f31 3049 4f5f 4d61 6e61 6765 723a 2830 2c32 3029 2c31 3630 2c33 323b 4d46 696c 654e 616d 655f 5f31 3049 4f5f
4106060 4d61 6e61 6765 723a 2830 2c32 3029 2c31 3932 2c33 323b 4346 696c 654e 616d 655f 5f31 3049 4f5f 4d61 6e61 6765 723a 2830
4106140 2c32 3029 2c32 3234 2c33 323b 6375 4c69 6e65 5f5f 3130 494f 5f4d 616e 6167 6572 3a28 302c 3129 2c32 3536 2c33 323b 3b00
4106220 494f 5f4d 616e 6167 6572 3a5a 6349 4f5f 4d61 6e61 6765 723b 3b5f 5f63 745f 5f31 3049 4f5f 4d61 6e61 6765 7246 5063 205f
4106300 5f64 745f 5f31 3049 4f5f 4d61 6e61 6765 7246 7620 494f 4368 6563 6b5f 5f31 3049 4f5f 4d61 6e61 6765 7246 7620 436f 7079
4106360 4669 6c65 546f 4c69 6e65 5f5f 3130 494f 5f4d 616e 6167 6572 4669 2043 6f70 7946 696c 6554 6f45 6e64 5f5f 3130 494f 5f4d
4106440 616e 6167 6572 4676 2053 7461 746d 656e 7448 616e 6465 6c65 725f 5f31 3049 4f5f 4d61 6e61 6765 7246 5063 5431 6920 5c00
4106520 436f 7079 4669 6c65 546f 4b65 7957 5f5f 3130 494f 5f4d 616e 6167 6572 4650 6354 3120 4561 745f 5374 6174 656d 656e 745f
4106600 5f31 3049 4f5f 4d61 6e61 6765 7246 5063 5431 2057 5f4f 7574 4669 6c65 5f5f 3130 494f 5f4d 616e 6167 6572 4650 6320 575f
4106660 4d46 696c 655f 5f31 3049 4f5f 4d61 6e61 6765 7246 5063 2057 5f43 4669 6c65 5f5f 3130 494f 5f4d 616e 6167 6572 4650 6320
4106740 3b3b 3b00 5f5f 4335 353a 5428 302c 3934 293d 7534 7376 616c 7565 3a28 302c 3230 292c 302c 3332 3b69 7661 6c75 653a 2830
4107020 2c31 292c 302c 3332 3b66 7661 6c75 653a 2830 2c39 292c 302c 3332 3b3b 005f 5f43 3535 3a5a 635f 5f43 3535 3b3b 3b3b 3b00
```

4107100 4765 6e56 616c 7565 3a54 2830 2c39 3529 3d73 3136 5f5f 7670 7472 5f5f 364f 626a 6563 743a 2830 2c33 3329 2c30 2c33 323b
4107160 6e61 6d65 5f5f 374e 4f62 6a65 6374 3a28 302c 3230 292c 3332 2c33 323b 7479 7065 5f5f 3847 656e 5661 6c75 653a 2830 2c37
4107240 3229 2c36 342c 3332 3b5f 5f4f 3535 5f5f 3847 656e 5661 6c75 653a 2830 2c39 3429 2c39 362c 3332 3b3b 0047 656e 5661 6c75
4107320 653a 5a63 4765 6e56 616c 7565 3b4e 4f62 6a65 6374 3b5f 5f63 745f 5f38 4765 6e56 616c 7565 4676 205f 5f63 745f 5f38 4765
4107400 6e56 616c 7565 4652 4338 4765 6e56 616c 7565 205f 5f64 745f 5f38 4765 6e56 616c 7565 4676 2073 6574 5f47 656e 5661 6c75
4107460 655f 7479 7065 5f5f 3847 656e 5661 6c75 6546 5063 6920 7365 745f 4765 6e56 616c 7565 5f74 7970 655f 5f38 4765 6e56 616c
4107540 7565 4631 3056 616c 7565 5f54 7970 6520 7365 745f 4765 6e56 616c 7565 5f5f 3847 656e 5661 6c75 6546 5063 205c 0073 6574
4107620 5f47 656e 5661 6c75 655f 5f38 4765 6e56 616c 7565 4669 2073 6574 5f47 656e 5661 6c75 655f 5f38 4765 6e56 616c 7565 4666
4107700 2067 6574 5f47 656e 5661 6c75 655f 7479 7065 5f5f 3847 656e 5661 6c75 6546 7620 6765 745f 4765 6e56 616c 7565 5f73 5f5f
4107760 3847 656e 5661 6c75 6546 7620 6765 745f 4765 6e56 616c 7565 5f69 5f5f 3847 656e 5661 6c75 6546 7620 6765 745f 4765 6e56
4110040 616c 7565 5f66 5f5f 3847 656e 5661 6c75 6546 7620 6578 706c 6169 6e5f 5f38 4765 6e56 616c 7565 4650 6320 5c00 6368 6563
4110120 6b5f 5f38 4765 6e56 616c 7565 4669 203b 3b3b 005f 5f70 7462 6c5f 5f38 4765 6e56 616c 7565 5f5f 4669 666f 5f63 7878 3a47
4110200 2830 2c33 3329 0070 6172 616d 6574 6572 3a54 2830 2c39 3629 3d73 3630 5f5f 7670 7472 5f5f 364f 626a 6563 743a 2830 2c33
4110260 3329 2c30 2c33 323b 6e61 6d65 5f5f 374e 4f62 6a65 6374 3a28 302c 3230 292c 3332 2c33 323b 6e61 6d65 5f5f 3970 6172 616d
4110340 6574 6572 3a28 302c 3230 292c 3634 2c33 323b 7479 7065 5f5f 3970 6172 616d 6574 6572 3a28 302c 3230 292c 3936 2c33 323b
4110420 7261 6e67 655f 5f39 7061 7261 6d65 7465 723a 2830 2c32 3029 2c31 3238 2c33 323b 736c 6963 655f 5f39 7061 7261 6d65 7465
4110500 723a 2830 2c32 3029 2c31 3630 2c33 323b 536c 6f77 5f5f 3970 6172 616d 6574 6572 3a28 302c 3129 2c31 3932 2c33 323b 5368
4110560 6967 695f 5f39 7061 7261 6d65 7465 723a 2830 2c31 292c 3232 342c 3332 3b5c 0050 436c 6173 735f 5f39 7061 7261 6d65 7465
4110640 723a 2830 2c37 3629 2c32 3536 2c33 323b 5058 5265 665f 5f39 7061 7261 6d65 7465 723a 2830 2c39 3729 3d2a 2830 2c39 3629
4110720 2c32 3838 2c33 323b 6d6f 6465 5f5f 3970 6172 616d 6574 6572 3a28 302c 3735 292c 3332 302c 3332 3b76 616c 7565 5f5f 3970
4111000 6172 616d 6574 6572 3a28 302c 3335 292c 3335 322c 3132 383b 3b00 7061 7261 6d65 7465 723a 5a63 7061 7261 6d65 7465 723b
4111060 4e4f 626a 6563 743b 5f5f 6374 5f5f 3970 6172 616d 6574 6572 4676 205f 5f63 745f 5f39 7061 7261 6d65 7465 7246 5243 3970
4111140 6172 616d 6574 6572 205f 5f64 745f 5f39 7061 7261 6d65 7465 7246 7620 6765 745f 7061 7261 6d65 7465 725f 6d6f 6465 5f5f
4111220 3970 6172 616d 6574 6572 4676 2067 6574 5f70 6172 616d 6574 6572 5f63 6c61 7373 5f5f 3970 6172 616d 6574 6572 4676 2067
4111300 6574 5f70 6172 615f 736c 6f77 5f5f 3970 6172 616d 6574 6572 4676 205c 0067 6574 5f70 6172 615f 7368 6967 685f 5f39 7061
4111360 7261 6d65 7465 7246 7620 6765 745f 7061 7261 6d65 7465 725f 7261 6e67 655f 5f39 7061 7261 6d65 7465 7246 7620 6765 745f
4111440 7061 7261 6d65 7465 725f 7479 7065 5f5f 3970 6172 616d 6574 6572 4676 2067 6574 5f70 6172 616d 6574 6572 5f6e 616d 655f
4111520 5f39 7061 7261 6d65 7465 7246 7620 6765 745f 7061 7261 6d65 7465 725f 736c 6963 655f 5f39 7061 7261 6d65 7465 7246 7620
4111600 6765 745f 7061 7261 6d65 7465 725f 5058 5245 465f 5f39 7061 7261 6d65 7465 7246 3130 5061 7261 5f43 6c61 7373 205c 0067
4111660 6574 5f63 6f72 7265 6374 5f6c 656e 6774 685f 5f39 7061 7261 6d65 7465 7246 7620 6765 745f 7061 7261 5f6c 656e 6774 685f
4111740 5f39 7061 7261 6d65 7465 7246 7620 6765 745f 7061 7261 5f73 7461 7475 735f 5f39 7061 7261 6d65 7465 7246 7620 6765 745f
4112020 7061 7261 6d65 7465 725f 7661 6c75 655f 5f39 7061 7261 6d65 7465 7246 7620 6765 745f 7061 7261 6d65 7465 725f 7661 6c75
4112100 655f 7479 7065 5f5f 3970 6172 616d 6574 6572 4676 2067 6574 5f70 6172 616d 6574 6572 5f73 7661 6c75 655f 5f39 7061 7261
4112160 6d65 7465 7246 7620 5c00 6765 745f 7061 7261 6d65 7465 725f 6976 616c 7565 5f5f 3970 6172 616d 6574 6572 4676 2067 6574
4112240 5f70 6172 616d 6574 6572 5f66 7661 6c75 655f 5f39 7061 7261 6d65 7465 7246 7620 7365 745f 7061 7261 6d65 7465 725f 6e61
4112320 6d65 5f5f 3970 6172 616d 6574 6572 4650 6320 7365 745f 7061 7261 6d65 7465 725f 636c 6173 735f 5f39 7061 7261 6d65 7465
4112400 7246 3130 5061 7261 5f43 6c61 7373 2073 6574 5f70 6172 616d 6574 6572 5f74 7970 655f 5f39 7061 7261 6d65 7465 7246 5063
4112460 2073 6574 5f70 6172 616d 6574 6572 5f73 6c69 6365 5f5f 3970 6172 616d 6574 6572 4650 6320 5c00 7365 745f 7061 7261 6d65
4112540 7465 725f 7372 616e 6765 5f5f 3970 6172 616d 6574 6572 4650 6320 7365 745f 7061 7261 6d65 7465 725f 5058 5265 665f 5f39
4112620 7061 7261 6d65 7465 7246 5063 5035 626c 6f63 6b20 7365 745f 7061 7261 6d65 7465 725f 7261 6e67 655f 5f39 7061 7261 6d65
4112700 7465 7246 5063 2073 6574 5f70 6172 616d 6574 6572 5f6d 6f64 655f 5f39 7061 7261 6d65 7465 7246 5063 2073 6574 5f70 6172
4112760 616d 6574 6572 5f76 616c 7565 5f5f 3970 6172 616d 6574 6572 4650 6320 7365 745f 7061 7261 6d65 7465 725f 7661 6c75 655f
4113040 5f39 7061 7261 6d65 7465 7246 6920 5c00 7365 745f 7061 7261 6d65 7465 725f 7661 6c75 655f 5f39 7061 7261 6d65 7465 7246
4113120 6620 7365 745f 7061 7261 6d65 7465 725f 7661 6c75 655f 7479 7065 5f5f 3970 6172 616d 6574 6572 4650 6320 6765 745f 5648
4113200 444c 5f46 6f72 6d61 6c5f 5061 7261 6d5f 5f39 7061 7261 6d65 7465 7246 5063 6920 6765 745f 5648 444c 5f50 726d 7472 5f5f
4113260 3970 6172 616d 6574 6572 4650 6369 2067 6574 5f56 4844 4c5f 4578 7061 6e64 6564 5f46 6f72 6d61 6c5f 5061 7261 6d5f 5f39
4113340 7061 7261 6d65 7465 7246 5035 626c 6f63 6b50 6369 205c 0067 6574 5f56 4844 4c5f 4578 7061 6e64 6564 5f50 726d 7472 5f4d
4113420 6170 5f5f 3970 6172 616d 6574 6572 4650 3562 6c6f 636b 5063 6920 6578 706c 6169 6e5f 5f39 7061 7261 6d65 7465 7246 5063
4113500 203b 3b3b 005f 5f70 7462 6c5f 5f39 7061 7261 6d65 7465 725f 5f46 6966 6f5f 6378 783a 4728 302c 3333 2900 626c 6f63 6b5f
4113560 6174 7472 6962 7574 6573 3a54 2830 2c39 3829 3d73 3238 5f5f 7670 7472 5f5f 364f 626a 6563 743a 2830 2c33 3329 2c30 2c33
4113640 323b 6e61 6d65 5f5f 374e 4f62 6a65 6374 3a28 302c 3230 292c 3332 2c33 323b 6e61 6d65 5f5f 3136 626c 6f63 6b5f 6174 7472
4113720 6962 7574 6573 3a28 302c 3230 292c 3634 2c33 323b 7661 6c75 655f 5f31 3662 6c6f 636b 5f61 7474 7269 6275 7465 733a 2830
4114000 2c39 3529 2c39 362c 3132 383b 3b00 626c 6f63 6b5f 6174 7472 6962 7574 6573 3a5a 6362 6c6f 636b 5f61 7474 7269 6275 7465
4114060 733b 4e4f 626a 6563 743b 5f5f 6374 5f5f 3136 626c 6f63 6b5f 6174 7472 6962 7574 6573 4650 6320 5f5f 6374 5f5f 3136 626c
4114140 6f63 6b5f 6174 7472 6962 7574 6573 4676 205f 5f63 745f 5f31 3662 6c6f 636b 5f61 7474 7269 6275 7465 7346 5243 3136 626c

```
4114220 6f63 6b5f 6174 7472 6962 7574 6573 205f 5f64 745f 5f31 3662 6c6f 636b 5f61 7474 7269 6275 7465 7346 7620 7365 745f 6174
4114300 7472 6962 7574 655f 6e61 6d65 5f5f 3136 626c 6f63 6b5f 6174 7472 6962 7574 6573 4650 6320 5c00 7365 745f 6174 7472 6962
4114360 7574 655f 7661 6c75 655f 5f31 3662 6c6f 636b 5f61 7474 7269 6275 7465 7346 5063 2073 6574 5f61 7474 7269 6275 7465 5f76
4114440 616c 7565 5f5f 3136 626c 6f63 6b5f 6174 7472 6962 7574 6573 4669 2073 6574 5f61 7474 7269 6275 7465 5f76 616c 7565 5f5f
4114520 3136 626c 6f63 6b5f 6174 7472 6962 7574 6573 4666 2073 6574 5f61 7474 7269 6275 7465 5f74 7970 655f 5f31 3662 6c6f 636b
4114600 5f61 7474 7269 6275 7465 7346 5063 2067 6574 5f61 7474 7269 6275 7465 5f6e 616d 655f 5f31 3662 6c6f 636b 5f61 7474 7269
4114660 6275 7465 7346 7620 5c00 6765 745f 6174 7472 6962 7574 655f 7479 7065 5f5f 3136 626c 6f63 6b5f 6174 7472 6962 7574 6573
4114740 4676 2067 6574 5f61 7474 7269 6275 7465 5f73 7661 6c75 655f 5f31 3662 6c6f 636b 5f61 7474 7269 6275 7465 7346 7620 6765
4115020 745f 6174 7472 6962 7574 655f 6976 616c 7565 5f5f 3136 626c 6f63 6b5f 6174 7472 6962 7574 6573 4676 2067 6574 5f61 7474
4115100 7269 6275 7465 5f66 7661 6c75 655f 5f31 3662 6c6f 636b 5f61 7474 7269 6275 7465 7346 7620 6765 745f 6174 7472 6962 7574
4115160 655f 7661 6c75 655f 5f31 3662 6c6f 636b 5f61 7474 7269 6275 7465 7346 7620 5c00 6578 706c 6169 6e5f 5f31 3662 6c6f 636b
4115240 5f61 7474 7269 6275 7465 7346 5063 203b 3b3b 005f 5f70 7462 6c5f 5f31 3662 6c6f 636b 5f61 7474 7269 6275 7465 735f 5f46
4115320 6966 6f5f 6378 743a 4728 302c 3333 2900 656e 7469 7479 3a54 2830 2c39 3929 3d73 3630 5f5f 7670 7472 5f5f 364f 626a 6563
4115400 743a 2830 2c33 3329 2c30 2c33 323b 6e61 6d65 5f5f 374e 4f62 6a65 6374 3a28 302c 3230 292c 3332 2c33 323b 6e61 6d65 5f5f
4115460 3665 6e74 6974 793a 2830 2c32 3029 2c36 342c 3332 3b46 696c 654e 616d 655f 5f36 656e 7469 7479 3a28 302c 3230 292c 3936
4115540 2c33 323b 6172 6368 6e61 6d65 5f5f 3665 6e74 6974 793a 2830 2c32 3029 2c31 3238 2c33 123b 7479 7065 5f5f 3665 6e74 6974
4115620 793a 2830 2c31 292c 3136 302c 3332 3b61 7263 685f 6c69 6e65 5f5f 3665 6e74 6974 793a 2830 2c31 292c 3139 322c 3332 3b63
4115700 616c 6c5f 6c69 6e65 5f5f 3665 6e74 6974 793a 2830 2c31 292c 3232 342c 3332 3b5c 0070 7263 735f 6c69 6e65 5f5f 3665 6e74
4115760 6974 793a 2830 2c31 292c 3235 362c 3332 3b71 7561 6c69 6669 6564 5f5f 3665 6e74 6974 793a 2830 2c38 3829 2c32 3838 2c39
4116040 363b 7375 625f 626c 6f63 6b73 5f5f 3665 6e74 6974 793a 2830 2c38 3829 2c33 3834 2c39 363b 3b00 656e 7469 7479 3a5a 6365
4116120 6e74 6974 793b 4e4f 626a 6563 743b 5f5f 6374 5f5f 3665 6e74 6974 7946 7620 5f5f 6374 5f5f 3665 6e74 6974 7946 5243 3665
4116200 6e74 6974 7920 5f5f 6474 5f5f 3665 6e74 6974 7946 7620 7365 745f 656e 7469 7479 5f6e 616d 655f 5f36 656e 7469 7479 4650
4116260 6320 7365 745f 656e 7469 7479 5f66 696c 655f 5f36 656e 7469 7479 4650 6320 7365 745f 656e 7469 7479 5f61 7263 686e 616d
4116340 655f 5f36 656e 7469 7479 4650 6320 7365 745f 656e 7469 7479 5f74 7970 655f 5f36 656e 7469 7479 4650 6320 5c00 7365 745f
4116420 6172 6368 5f6c 696e 655f 5f36 656e 7469 7479 4669 2073 6574 5f63 616c 6c5f 6c69 6e65 5f5f 3665 6e74 6974 7946 6920 7365
4116500 745f 7072 6373 5f6c 696e 655f 5f36 656e 7469 7479 4669 2067 6574 5f65 6e74 6974 795f 6e61 6d65 5f5f 3665 6e74 6974 7946
4116560 7620 6765 745f 656e 7469 7479 5f61 7263 686e 616d 655f 5f36 656e 7469 7479 4676 2067 6574 5f65 6e74 6974 795f 6669 6c65
4116640 5f5f 3665 6e74 6974 7946 7620 6765 745f 656e 7469 7479 5f74 7970 655f 5f36 656e 7469 7479 4676 205c 0067 6574 5f61 7263
4116720 685f 6c69 6e65 5f5f 3665 6e74 6974 7946 7620 6765 745f 6361 6c6c 5f6c 696e 655f 5f36 656e 7469 7479 4676 2067 6574 5f70
4117000 7263 735f 6c69 6e65 5f5f 3665 6e74 6974 7946 7620 6973 4754 455f 5f36 656e 7469 7479 4650 364f 626a 6563 7420 6973 4c54
4117060 455f 5f36 656e 7469 7479 4650 364f 626a 6563 7420 6578 706c 6169 6e5f 5f36 656e 7469 7479 4650 6320 3b3b 3b00 5f5f 7074
4117140 626c 5f5f 3665 6e74 6974 795f 5f46 6966 6f5f 6378 783a 4728 302c 3333 2900 626c 6f63 6b3a 5428 302c 3130 3029 3d73 3134
4117220 305f 5f76 7074 725f 5f36 4f62 6a65 6374 3a28 302c 3333 292c 302c 3332 3b6e 616d 655f 5f37 4e4f 626a 6563 743a 2830 2c32
4117300 3029 2c33 322c 3332 3b6e 6161 655f 5f35 626c 6f63 6b3a 2830 2c32 3029 2c36 342c 3332 3b74 7970 655f 5f35 626c 6f63 6b3a
4117360 2830 2c31 292c 3936 2c33 323b 4347 5f4e 616d 655f 5f35 626c 6f63 6b3a 2830 2c32 3029 2c31 3238 2c33 323b 4d47 5f54 7970
4117440 655f 5f35 626c 6f63 6b3a 2830 2c32 3029 2c31 3630 2c33 323b 4347 5f53 7562 5479 7065 5f5f 3562 6c6f 636b 3a28 302c 3230
4117520 292c 3139 322c 3332 3b50 6172 656e 745f 5f35 626c 6f63 6b3a 2830 2c39 3929 2c32 3234 2c34 3830 3b5c 004d 4744 7363 7270
4117600 746e 5f5f 3562 6c6f 636b 3a28 302c 3130 3129 3d2a 2830 2c39 3229 2c37 3034 2c33 323b 4163 7475 616c 5f5f 3562 6c6f 636b
4117660 3a28 302c 3838 292c 3733 362c 3936 3b46 6f72 6d61 6c5f 5f35 626c 6f63 6b3a 2830 2c38 3829 2c38 3332 2c39 363b 5265 736f
4117740 6c76 6564 5f5f 3562 6c6f 636b 3a28 302c 3838 292c 3932 382c 3936 3b41 7474 7269 6275 7465 735f 5f35 626c 6f63 6b3a 2830
4120020 2c38 3829 2c31 3032 342c 3936 3b3b 0062 6c6f 636b 3a5a 6362 6c6f 636b 3b4e 4f62 6a65 6374 3b5f 5f63 745f 5f35 626c 6f63
4120100 6b46 7620 5f5f 6374 5f5f 3562 6c6f 636b 4652 4335 626c 6f63 6b20 5f5f 6474 5f5f 3562 6c6f 636b 4676 2073 6574 5f62 6c6f
4120160 636b 5f6e 616d 655f 5f35 626c 6f63 6b46 5063 2073 6574 5f62 6c6f 636b 5f74 7970 655f 5f35 626c 6f63 6b46 5063 2067 6574
4120240 5f62 6c6f 636b 5f6e 616d 655f 5f35 626c 6f63 6b46 7620 6765 745f 626c 6f63 6b5f 7479 7065 5f5f 3562 6c6f 636b 4676 2067
4120320 6574 5f62 6c6f 636b 5f70 6172 656e 745f 5f35 626c 6f63 6b46 7620 5c00 6765 745f 626c 6f63 6b5f 436f 6447 656e 5f5f 3562
4120400 6c6f 636b 4676 2067 6574 5f46 6f72 6d61 6c5f 5f35 626c 6f63 6b46 7620 6765 745f 4163 7475 616c 5f5f 3562 6c6f 636b 4676
4120460 2067 6574 5f52 6573 6f6c 7665 645f 5f35 626c 6f63 6b46 7620 6765 745f 4174 7472 6962 7574 655f 5f35 626c 6f63 6b46 7620
4120540 6765 745f 636f 6170 5f6c 656e 6774 685f 5f35 626c 6f63 6b46 7620 6973 5175 616c 6966 6965 645f 5f35 626c 6f63 6b46 7620
4120620 6973 4c54 455f 5f35 626c 6f63 6b46 5036 4f62 6a65 6374 205c 0069 7347 5445 5f5f 3562 6c6f 636b 4650 364f 626a 6563 7420
4120700 6578 706c 6169 6e5f 5f35 626c 6f63 6b46 5063 2052 6576 6572 7365 416c 6c4c 6973 7473 5f5f 3562 6c6f 636b 4676 2043 6865
4120760 636b 5061 7261 4c69 7374 735f 5f35 626c 6f63 6b46 7620 4368 6563 6b50 6172 616d 4c69 7374 5f5f 3562 6c6f 636b 4650 3550
4121040 4c69 7374 2057 5f56 4844 4c5f 436f 6d70 496e 7374 5f5f 3562 6c6f 636b 4676 2057 5f56 4844 4c5f 436f 6d70 4465 635f 5f35
4121120 626c 6f63 6b46 7620 6765 745f 5648 444c 5f43 6f6d 704c 6162 6c65 5f5f 3562 6c6f 636b 4650 6320 5c00 6765 745f 5648 444c
4121200 5f43 6f6d 704e 616d 655f 5f35 626c 6f63 6b46 5063 2057 5f4d 475f 436f 6d70 4473 6372 7074 6e5f 5f35 626c 6f63 6b46 7620
4121260 575f 4d47 5f43 6365 636b 436f 6d70 5f5f 3562 6c6f 636b 4676 2057 5f43 4c5f 4172 6368 426f 6479 5f5f 3562 6c6f 636b 4676
```

| | | | | | | | | | | | | | | | | | | | | | | | | |
|---|---|---|---|---|---|---|---|---|---|---|---|---|---|---|---|---|---|---|---|---|---|---|---|---|
| 4121340 | 2057 | 5f43 | 4c5f | 456e | 7469 | 7479 | 4465 | 635f | 5f35 | 626c | 6f63 | 6b46 | 7620 | 3b3b | 3b00 | 5f5f | 7074 | 626c | 5f5f | 3562 | 6c6f | 636b | 5f5f | 4669 |
| 4121420 | 666f | 5f63 | 7878 | 3a47 | 2830 | 2c33 | 3329 | 005f | 5f63 | 745f | 5f36 | 656e | 7469 | 7479 | 4676 | 3a66 | 2830 | 2c31 | 3032 | 293d | 2a28 | 302c | 3939 | 2900 |
| 4121500 | 5f5f | 3074 | 6869 | 733a | 7028 | 302c | 3130 | 3229 | 002f | 686f | 6d65 | 2f6f | 7361 | 7331 | 2f61 | 2f61 | 622f | 7372 | 632f | 6e65 | 776f | 626a | 6563 | 7473 |
| 4121560 | 2f70 | 726f | 672f | 6878 | 782f | 656e | 7469 | 7479 | 2e69 | 7878 | 005f | 5f30 | 7468 | 6973 | 3a72 | 2830 | 2c31 | 3032 | 2900 | 5f5f | 3074 | 6869 | 7320 | 3a5a |
| 4121640 | 746c | 005f | 5f63 | 745f | 5f36 | 656e | 7469 | 7479 | 4676 | 203a | 5a74 | 4600 | 4465 | 7369 | 676e | 556e | 6974 | 3a54 | 2830 | 2c31 | 3033 | 293d | 7335 | 325f |
| 4121720 | 5f76 | 7074 | 725f | 5f36 | 4f62 | 6a65 | 6374 | 3a28 | 302c | 3333 | 292c | 302c | 3332 | 3b6e | 616d | 655f | 5f37 | 4e4f | 626a | 6563 | 743a | 2830 | 2c32 | 3029 |
| 4122000 | 2c33 | 322c | 3332 | 3b44 | 6555 | 6e4e | 616d | 655f | 5f31 | 3044 | 6573 | 6967 | 6e55 | 6e69 | 743a | 2830 | 2c32 | 3029 | 2c36 | 342c | 3332 | 3b46 | 696c | 654e |
| 4122060 | 616d | 655f | 5f31 | 3044 | 6573 | 6967 | 6e55 | 6e69 | 743a | 2830 | 2c32 | 3029 | 2c39 | 362c | 3332 | 3b41 | 7263 | 684e | 616d | 655f | 5f31 | 3044 | 6573 | 6967 |
| 4122140 | 6e55 | 6e69 | 743a | 2830 | 2c32 | 3029 | 2c31 | 3238 | 2c33 | 323b | 4465 | 556e | 5479 | 7065 | 5f5f | 3130 | 4465 | 7369 | 676e | 556e | 6974 | 3a28 | 302c | 3129 |
| 4122220 | 2c31 | 3530 | 2c33 | 323b | 4172 | 6368 | 4c69 | 6e65 | 5f5f | 3130 | 4465 | 7369 | 676e | 556e | 6974 | 3a28 | 302c | 3129 | 2c31 | 3932 | 2c33 | 323b | 5175 | 616c |
| 4122300 | 6966 | 6365 | 645f | 5f31 | 3044 | 6573 | 6967 | 6e55 | 6e69 | 743a | 2830 | 2c38 | 3929 | 2c32 | 3234 | 2c39 | 363b | 5375 | 6242 | 6c6f | 636b | 735f | 5f31 | 3044 |
| 4122360 | 6573 | 6967 | 6e55 | 6e69 | 743a | 2830 | 2c38 | 3829 | 2c33 | 3230 | 2c39 | 363b | 3b00 | 4465 | 7369 | 676e | 556e | 6974 | 3a5a | 6344 | 6573 | 6967 | 6e55 | 6e69 |
| 4122440 | 743b | 4e4f | 626a | 6563 | 743b | 5f5f | 6374 | 5f5f | 3130 | 4465 | 7369 | 676e | 556e | 6974 | 4676 | 205f | 5f63 | 745f | 5f31 | 3044 | 6573 | 6967 | 6e55 | 6e69 |
| 4122520 | 7446 | 5063 | 205f | 5f63 | 745f | 5f31 | 3044 | 6573 | 6967 | 6e55 | 6e69 | 7446 | 5036 | 656e | 7469 | 7479 | 205f | 5f63 | 745f | 5f31 | 3044 | 6573 | 6967 | 6e55 |
| 4122600 | 6e69 | 7446 | 5243 | 3130 | 4465 | 7369 | 676e | 556e | 6974 | 205f | 5f64 | 745f | 5f31 | 3044 | 6573 | 6967 | 6e55 | 6e69 | 7446 | 7620 | 7365 | 745f | 4455 | 5f44 |
| 4122660 | 6555 | 6e4e | 616d | 655f | 5f31 | 3044 | 6573 | 6967 | 6e55 | 6e69 | 7446 | 5063 | 205c | 0073 | 6574 | 5f44 | 555f | 4669 | 6c65 | 4e61 | 6d65 | 5f5f | 3130 | 4465 |
| 4122740 | 7369 | 676e | 556e | 6974 | 4650 | 6320 | 7365 | 745f | 4455 | 5f41 | 7263 | 684e | 616d | 655f | 5f31 | 3044 | 6573 | 6967 | 6e55 | 6e69 | 7446 | 5063 | 2073 | 6574 |
| 4123020 | 5f44 | 555f | 4465 | 556e | 5479 | 7065 | 5f5f | 3130 | 4465 | 7369 | 676e | 556e | 6974 | 4669 | 2073 | 6574 | 5f44 | 555f | 4172 | 6368 | 4c69 | 6e65 | 5f5f | 3130 |
| 4123100 | 4465 | 7369 | 676e | 556e | 6974 | 4669 | 2067 | 6574 | 5f44 | 555f | 4669 | 6c65 | 4e61 | 6d65 | 5f5f | 3130 | 4465 | 7369 | 676e | 556e | 6974 | 4676 | 2045 | 7175 |
| 4123160 | 616c | 5f5f | 3130 | 4465 | 7369 | 676e | 556e | 6974 | 4650 | 3665 | 6e74 | 6974 | 7320 | 5c00 | 6973 | 4754 | 455f | 5f31 | 3044 | 6573 | 6967 | 6e55 | 6e69 | 7446 |
| 4123240 | 5036 | 4f62 | 6a65 | 6374 | 2069 | 734c | 5445 | 5f5f | 3130 | 4465 | 7369 | 676e | 556e | 6974 | 4650 | 364f | 626a | 6563 | 7420 | 6765 | 745f | 4455 | 5f51 | 7561 |
| 4123320 | 6c69 | 6669 | 6564 | 5f5f | 3130 | 4465 | 7369 | 676e | 556e | 6974 | 4676 | 2067 | 6574 | 5f44 | 555f | 5375 | 6242 | 6c6f | 636b | 735f | 5f31 | 3044 | 6573 | 6967 |
| 4123400 | 6e55 | 6e69 | 7446 | 7620 | 4578 | 7061 | 6e64 | 5f56 | 4844 | 4c5f | 4455 | 5f5f | 3130 | 4465 | 7369 | 676e | 556e | 6974 | 4676 | 2065 | 7870 | 6c61 | 696e | 5f5f |
| 4123460 | 3130 | 4465 | 7369 | 676e | 556e | 6974 | 4650 | 6320 | 3b3b | 3b00 | 5f5f | 7074 | 626c | 5f5f | 3130 | 4465 | 7369 | 676e | 556e | 6974 | 5f5f | 4669 | 666f | 5f63 |
| 4123540 | 7878 | 3a47 | 2830 | 2c33 | 3329 | 0046 | 696c | 6555 | 6e69 | 743a | 5428 | 302c | 3130 | 3429 | 3d73 | 3234 | 5f5f | 7670 | 7472 | 5f5f | 364f | 626a | 6563 | 743a |
| 4123620 | 2830 | 2c33 | 3329 | 2c30 | 2c33 | 323b | 6e61 | 6d65 | 5f5f | 374e | 4f62 | 6a65 | 6374 | 3a28 | 302c | 3230 | 292c | 3332 | 2c33 | 323b | 4669 | 6c65 | 4e61 | 6d65 |
| 4123700 | 5f5f | 3346 | 696c | 6555 | 6e69 | 743a | 2830 | 2c32 | 3029 | 2c36 | 342c | 3332 | 3b45 | 6e74 | 6974 | 794c | 6973 | 745f | 5f38 | 4669 | 6c65 | 556e | 6974 | 3a28 |
| 4123760 | 302c | 3838 | 292c | 3736 | 2c39 | 363b | 3b00 | 4669 | 6c65 | 556e | 6974 | 3a5a | 6346 | 696c | 6555 | 6e69 | 743b | 4e4f | 626a | 6563 | 743b | 5f5f | 6374 | 5f5f |
| 4124040 | 3846 | 696c | 6555 | 6e69 | 7446 | 7620 | 5f5f | 6374 | 5f5f | 3846 | 696c | 6555 | 6e69 | 7446 | 5063 | 205f | 5f63 | 745f | 5f38 | 4669 | 6c65 | 556e | 6974 | 4652 |
| 4124120 | 4338 | 4669 | 6c65 | 556e | 6974 | 205f | 5f64 | 745f | 5f38 | 4669 | 6c65 | 556e | 6974 | 4676 | 2073 | 6574 | 5f46 | 555f | 4669 | 6c65 | 4e61 | 6d65 | 5f5f | 3846 |
| 4124200 | 696c | 6555 | 6e69 | 7446 | 5063 | 2067 | 6574 | 5f46 | 555f | 4669 | 6c65 | 4e61 | 6d65 | 5f5f | 3846 | 696c | 6555 | 6e69 | 7446 | 7620 | 6765 | 745f | 456e | 7469 |
| 4124260 | 7479 | 4c69 | 7374 | 5f5f | 3846 | 696c | 6555 | 6e69 | 7446 | 7620 | 5c00 | 4578 | 7061 | 6e64 | 5f56 | 4844 | 4c5f | 4455 | 5f5f | 3846 | 696c | 6555 | 6e69 | 7446 |
| 4124340 | 7620 | 6578 | 706c | 6169 | 6e5f | 5f38 | 4669 | 6c65 | 556e | 6974 | 4650 | 6320 | 3b3b | 3b00 | 5f5f | 7074 | 626c | 5f5f | 3846 | 696c | 6555 | 6e69 | 745f | 5f46 |
| 4124420 | 6966 | 6f5f | 6378 | 783a | 4728 | 302c | 3333 | 2900 | 416c | 6c42 | 6c6f | 636b | 733a | 5428 | 302c | 3130 | 3529 | 3d73 | 3434 | 5f5f | 7670 | 7472 | 5f5f | 364f |
| 4124500 | 626a | 6563 | 743a | 2830 | 2c33 | 3329 | 2c30 | 2c33 | 323b | 6e61 | 6d65 | 5f5f | 374e | 4f62 | 6a65 | 6374 | 3a28 | 302c | 3230 | 292c | 3332 | 2c33 | 323b | 426c |
| 4124560 | 6f63 | 6b4c | 6973 | 745f | 5f39 | 416c | 6c42 | 6c6f | 636b | 733a | 2830 | 2c38 | 3829 | 2c36 | 342c | 3936 | 3b44 | 554c | 6973 | 745f | 5f39 | 416c | 6c42 | 6c6f |
| 4124640 | 636b | 733a | 2830 | 2c38 | 3829 | 2c31 | 3630 | 2c39 | 363b | 4655 | 4c69 | 7374 | 5f5f | 3941 | 6c6c | 426c | 6f63 | 6b73 | 3a28 | 302c | 3838 | 292c | 3235 | 362c |
| 4124720 | 3936 | 3b3b | 0041 | 6c6c | 426c | 6f63 | 6b73 | 3a5a | 6341 | 6c6c | 426c | 6f63 | 6b73 | 3b4e | 4f62 | 6a65 | 6374 | 3b5f | 5f63 | 745f | 5f39 | 416c | 6c42 | 6c6f |
| 4125000 | 636b | 7346 | 7620 | 5f5f | 6374 | 5f5f | 3941 | 6c6c | 426c | 6f63 | 6b73 | 4652 | 4339 | 416c | 6c42 | 6c6f | 636b | 7320 | 745f | 5f38 | 6474 | 5f5f | 3941 | 6c6c | 426c |
| 4125060 | 6f63 | 6b73 | 4676 | 2067 | 6574 | 5f42 | 6c6f | 636b | 4c69 | 7374 | 5f5f | 3941 | 6c6c | 426c | 6f63 | 6b73 | 4676 | 2067 | 6574 | 5f44 | 554c | 6973 | 745f | 5f39 |
| 4125140 | 416c | 6c42 | 6c6f | 636b | 7346 | 7620 | 6765 | 745f | 4655 | 4c69 | 7374 | 5f5f | 3941 | 6c6c | 426c | 6f63 | 6b73 | 4676 | 2052 | 6561 | 645f | 5648 | 444c | 5f42 |
| 4125220 | 6c6b | 4669 | 6c65 | 5f5f | 3941 | 6c6c | 426c | 6f63 | 6b73 | 4650 | 6320 | 5c00 | 5265 | 7665 | 7273 | 6550 | 6172 | 616d | 4c69 | 7374 | 735f | 5f39 | 416c | 6c42 |
| 4125300 | 6c6f | 636b | 7346 | 7620 | 6d61 | 6b65 | 5f44 | 554c | 6973 | 745f | 5f39 | 416c | 6c42 | 6c6f | 636b | 7346 | 7620 | 6d61 | 6b65 | 5f46 | 554c | 6973 | 745f | 5f39 |
| 4125360 | 416c | 6c42 | 6c6f | 636b | 7346 | 7620 | 4578 | 7061 | 6e64 | 5f56 | 4844 | 4c5f | 4655 | 5f5f | 3941 | 6c6c | 426c | 6f63 | 6b73 | 4676 | 2065 | 7870 | 6c61 | 696e |
| 4125440 | 5f5f | 3941 | 6c6c | 426c | 6f63 | 6b73 | 4650 | 6320 | 3b3b | 3b00 | 5f5f | 7074 | 626c | 5f5f | 3941 | 6c6c | 426c | 6f63 | 6b73 | 5f5f | 4669 | 666f | 5f63 | 7878 |
| 4125520 | 3a47 | 2830 | 2c33 | 3329 | 004d | 475f | 5370 | 6563 | 6966 | 6963 | 3a54 | 2830 | 2c31 | 3036 | 293d | 7331 | 3274 | 6563 | 686e | 6f6c | 6f67 | 795f | 5f31 | 314d |
| 4125600 | 475f | 5370 | 6563 | 6966 | 6963 | 3a28 | 302c | 3230 | 292c | 302c | 3332 | 3b6c | 6273 | 5f74 | 6563 | 684e | 756d | 5f5f | 3131 | 4d47 | 5f53 | 7065 | 6369 | 6669 |
| 4125660 | 633a | 2830 | 2c31 | 292c | 3332 | 2c33 | 323b | 4d65 | 6d5f | 7465 | 6368 | 4e75 | 6d5f | 5f31 | 314d | 475f | 5370 | 6563 | 6966 | 6963 | 3a28 | 302c | 3129 | 2c36 |
| 4125740 | 342c | 3332 | 3b3b | 004d | 475f | 5370 | 6563 | 6966 | 6963 | 3a5a | 634d | 475f | 5370 | 6563 | 6966 | 6963 | 3b3b | 5f5f | 6374 | 5f5f | 3131 | 4d47 | 5f53 | 7065 |
| 4126020 | 6369 | 6669 | 6346 | 7620 | 5f5f | 6474 | 5f5f | 3131 | 4d47 | 5f53 | 7065 | 6369 | 6669 | 6346 | 7620 | 7365 | 745f | 7465 | 6368 | 6e6f | 6c6f | 6779 | 5f6e | 616d |
| 4126100 | 655f | 5f31 | 314d | 475f | 5370 | 6563 | 6966 | 6963 | 4650 | 6320 | 6765 | 745f | 6c62 | 735f | 7465 | 6368 | 4e75 | 6d5f | 5f31 | 314d | 475f | 5370 | 6563 | 6966 |
| 4126160 | 6963 | 4676 | 2067 | 6574 | 5f4d | 656d | 5f74 | 6563 | 684e | 756d | 5f5f | 3131 | 4d47 | 5f53 | 7065 | 6369 | 6669 | 6346 | 7620 | 6765 | 745f | 7465 | 6368 | 4e61 |
| 4126240 | 6d65 | 5f5f | 3131 | 4d47 | 5f53 | 7065 | 6369 | 6669 | 6346 | 7620 | 5c00 | 6578 | 706c | 6169 | 6e5f | 5f31 | 314d | 475f | 5370 | 6563 | 6966 | 6963 | 4650 | 6320 |
| 4126320 | 3b3b | 3b00 | 4669 | 666f | 3a54 | 2830 | 2c31 | 3037 | 293d | 7334 | 3842 | 6974 | 5769 | 6474 | 685f | 5f36 | 4d6f | 6447 | 656e | 3a28 | 302c | 3129 | 2c30 | 2c33 |
| 4126400 | 323b | 4553 | 7461 | 7465 | 5f5f | 364d | 6f64 | 4765 | 6e3a | 2830 | 2c37 | 3829 | 2c33 | 322c | 3332 | 3b50 | 696e | 4e61 | 6d65 | 4c65 | 6e67 | 7468 | 5f5f | 364d |

```
4126460  6f64 4765 6e3a 2830 2c38 3829 2c36 342c 3936 3b5f 5f76 7074 725f 5f36 4d6f 6447 656e 3a28 302c 3333 292c 3136 302c 3332
4126540  3b74 7970 655f 5f34 4669 666f 3a28 302c 3230 292c 3139 322c 3332 3b6d 6169 6e5f 6d65 6e75 5f5f 3446 6966 6f3a 2830 2c31
4126620  292c 3232 342c 3332 3b73 7562 5f6d 656e 755f 5f34 4669 666f 3a28 302c 3129 2c32 3536 2c33 323b 6d6f 6475 6c65 6e61 6d65
4126700  5f5f 3446 6966 6f3a 2830 2c32 3029 2c32 3838 2c33 323b 5c00 7769 6474 685f 5f34 4669 666f 3a28 302c 3129 2c33 3230 2c33
4126760  323b 6465 7074 685f 5f34 4669 666f 3a28 302c 3129 2c33 3532 2c33 323b 3b00 4669 666f 3a5a 6346 6966 6f3b 4d6f 6447 656e
4127040  3b5f 5f63 745f 5f34 4669 666f 4650 6320 5f5f 6374 5f5f 3446 6966 6f46 7620 5f5f 6374 5f5f 3446 6966 6f46 5243 3446 6966
4127120  6f20 5f5f 6474 5f5f 3446 6966 6f46 7620 7365 744e 616d 6549 6e64 6578 5f5f 3446 6966 6f46 5063 2073 6574 496e 6465 785f
4127200  5f34 4669 666f 4676 204c 6f61 645f 5648 444c 5f44 6174 615f 5f34 4669 666f 4650 374e 4f62 6a65 6374 2043 6f6d 706f 7365
4127260  5f4d 6f64 4765 6e5f 4465 7363 7269 7074 6f72 5f5f 3446 6966 6f46 5063 205c 003b 3b3b 005f 5f70 7462 6c5f 5f34 4669 666f
4127340  5f5f 4669 666f 5f63 7878 3a47 2830 2c33 3329 0074 656d 7044 473a 4728 302c 3230 2900 4d47 3a47 2830 2c31 3038 293d 2a28
4127420  302c 3130 3629 0073 6574 496e 6465 785f 5f34 4669 666f 4676 3a46 2830 2c32 2900 5f5f 3074 6869 733a 7028 302c 3130 3929
4127500  3d2a 2830 2c31 3037 2900 4669 666f 2e63 7878 005f 5f30 7468 6973 203a 5a74 6c00 7365 7449 6e64 6578 5f5f 3446 6966 6f46
4127560  7620 3a5a 7446 004c 6f61 645f 5648 444c 5f44 6174 615f 5f34 4669 666f 4650 374e 4f62 6a65 6374 3a46 2830 2c32 2900 5f5f
4127640  3074 6869 733a 7028 302c 3130 3929 005f 5f30 4e3a 7028 302c 3836 2900 5f5f 3074 6869 733a 7228 302c 3130 3929 005f 5f31
4127720  423a 2830 2c31 3130 293d 2a29 302c 3130 3029 005f 5f31 4154 523a 2830 2c31 3131 293d 2a28 302c 3938 2900 5f5f 3150 696e
4130000  5074 723a 2830 2c39 3729 005f 5f31 5069 6e4e 616d 653a 2830 2c32 3029 005f 5f30 5f5f 4b36 353a 2830 2c31 3132 293d 2a28
4130060  302c 3838 2900 5f5f 305f 5f4b 3636 3a28 302c 3131 3229 005f 5f30 5f5f 5842 3030 7969 6a30 6965 3a28 302c 3738 2900 5f5f
4130140  3074 6869 7320 3a5a 746c 005f 5f30 4e20 3a5a 746c 005f 5f31 4220 3a5a 746c 005f 5f31 4154 5220 3a5a 746c 005f 5f31 5069
4130220  6e50 7472 203a 5a74 6c00 5f5f 3150 696e 4e61 6d65 203a 5a74 6c00 5f5f 305f 5f4b 3635 203a 5a74 6c00 5f5f 305f 5f4b 3636
4130300  203a 5a74 6c00 4c6f 6164 5f56 4844 4c5f 4461 7461 5f5f 3446 6966 6f46 5037 4e4f 626a 6563 7420 3a5a 7446 0043 6f6d 706f
4130360  7365 5f4d 6f64 4765 6e5f 4465 7363 7269 7074 6f72 5f5f 3446 6966 6f46 5063 3a46 2830 2c32 3029 005f 5f30 7468 6973 3a70
4130440  2830 2c31 3039 2900 5f5f 3062 7566 663a 7028 302c 3230 2900 5f5f 3074 6869 733a 7228 302c 3130 3929 005f 5f30 7468 6973
4130520  203a 5a74 6c00 5f5f 3062 7566 6620 3a5a 746c 0043 6f6d 706f 7365 5f4d 6f64 4765 6e5f 4465 7363 7269 7074 6f72 5f5f 3446
4130600  6966 6f46 5063 203a 5a74 4600 5f5f 7374 695f 5f46 6966 6f5f 6378 785f 7365 7449 6e64 6578 5f3a 4628 302c 3229 002f 7573
4130660  722f 4343 2f73 756e 342f 696e 636c 2f69 6f73 7472 6561 6d2e 6800 5f5f 7374 645f 5f46 6966 6f5f 6378 785f 7365 7449 6e64
4130740  6578 5f3a 4628 302c 3229 005f 5f76 7462 6c5f 5f34 4669 666f 3a47 2830 2c31 3133 293d 6172 2830 2c31 293b 303b 363b 2830
4131020  2c31 3529 005f 5f76 7462 6c5f 5f31 3662 6c6f 636b 5f61 7474 7269 6275 7465 735f 5f46 6966 6f5f 6378 783a 4728 302c 3131
4131100  3429 3d61 7228 302c 3129 3b30 3b31 303b 2830 2c31 3529 005f 5f76 7462 6c5f 5f38 4c50 4f62 6a65 6374 5f5f 4669 666f 5f63
4131160  7878 3a47 2830 2c31 3135 293d 6172 2830 2c31 293b 303b 333b 2830 2c31 3529 0073 6574 4e61 6d65 496e 6465 785f 5f34 4669
4131240  666f 4650 633a 6628 302c 3229 005f 5f30 7468 6973 3a70 2830 2c31 3039 2900 5f5f 3074 3a70 2830 2c32 3029 002e 2f68 7878
4131320  2f46 6966 6f2e 6878 7800 5f5f 3074 6869 7320 3a5a 746c 005f 5f30 7420 3a5a 746c 0073 6574 4e61 6d65 496e 6465 785f 5f34
4131400  4669 666f 4650 6320 3a5a 7446 0073 6574 5f46 555f 4669 6c65 4e61 6d65 5f5f 3846 696c 6555 6e69 7446 5063 3a66 2830 2c32
4131460  2900 5f5f 3074 6869 733a 7028 302c 3131 3629 3d2a 2830 2c31 3034 2900 5f5f 3073 3a70 2830 2c32 3029 002f 686f 6d65 2f6f
4131540  7361 7331 2f61 2f61 622f 7372 632f 6e65 776f 626a 6563 7473 2f70 726f 672f 6878 782f 4669 6c65 556e 2e68 7878 005f 5f30
4131620  7468 6973 3a72 2830 2c31 3136 2900 5f5f 3074 6869 7320 3a5a 746c 005f 5f30 7320 3a5a 746c 0073 6574 5f46 555f 4669 6c65
4131700  4e61 6d65 5f5f 3846 696c 6555 6e69 7446 5063 203a 5a74 4600 6578 706c 6169 6e5f 5f31 3662 6c6f 636b 5f61 7474 7269 6275
4131760  7465 7346 5063 3a66 2830 2c32 2900 5f5f 3074 6869 733a 7028 302c 3131 3129 005f 5f30 733a 7028 302c 3230 2900 2f68 6f6d
4132040  652f 6f73 6173 312f 612f 6162 2f73 7263 2f6e 6577 6f62 6a65 6374 732f 7072 6f67 2f68 7878 2f61 7474 7269 6275 7465 2e68
4132120  7878 005f 5f30 7468 6973 3a72 2830 2c31 3131 2900 5f5f 3074 6869 7320 3a5a 746c 005f 5f30 7320 3a5a 746c 0065 7870 6c61
4132200  696e 5f5f 3136 626c 6f63 6b5f 6174 7472 6962 7574 6573 4650 6320 3a5a 7446 0073 6574 5f70 6172 616d 6574 6572 5f76 616c
4132260  7565 5f74 7970 655f 5f39 7061 7261 6d65 7465 7246 5063 3a66 2830 2c32 2900 5f5f 3074 6869 733a 7028 302c 3937 2900 5f5f
4132340  3073 3a70 2830 2c32 3029 002f 686f 6d65 2f6f 7361 7331 2f61 2f61 622f 7372 632f 6e65 776f 626a 6563 7473 2f70 726f 672f
4132420  6878 782f 7061 7261 6d65 7465 722e 6878 7800 5f5f 3074 6869 733a 7228 302c 3937 2900 5f5f 3074 6869 7320 3a5a 746c 005f
4132500  5f30 7320 3a5a 746c 0073 6574 5f70 6172 616d 6574 6572 5f76 616c 7565 5f74 7970 655f 5f39 7061 7261 6d65 7465 7246 5063
4132560  203a 5a74 4600 6578 706c 6169 6e5f 5f38 4c50 4f62 6a65 6374 4650 633a 6628 302c 3229 005f 5f30 7468 6973 3a70 2830 2c31
4132640  3137 293d 2a28 302c 3835 2900 5f5f 3073 3a70 2830 2c32 3029 002f 686f 6d65 2f6f 7361 7331 2f61 2f61 622f 7372 632f 6e65
4132720  776f 626a 6563 7473 2f68 7878 2f4c 504f 626a 6563 745f 6462 2e68 7878 005f 5f30 7468 6973 3a72 2830 2c31 3137 2900 5f5f
4133000  3074 6869 7320 3a5a 746c 005f 5f30 7320 3a5a 746c 0065 7870 6c61 696e 5f5f 384c 504f 626a 6563 7446 5063 203a 5a74 4600
4133060  6973 4c54 455f 5f37 4e4f 626a 6563 7446 5036 4f62 6a65 6374 3a66 2830 2c31 2900 5f5f 3074 6869 733a 7028 302c 3836 2900
4133140  5f5f 305f 5f41 3339 3a70 2830 2c31 3138 293d 2a28 302c 3739 2900 2f68 6f6d 652f 6f73 6173 312f 612f 6162 2f73 7263 2f6e
4133220  6577 6f62 6a65 6374 732f 6878 782f 4e4f 626a 6563 745f 6462 2e68 7878 005f 5f30 7468 6973 203a 5a74 6c00 5f5f 305f 5f41
4133300  3339 203a 5a74 6c00 6973 4c54 455f 5f37 4e4f 626a 6563 7446 5036 4f62 6a65 6374 203a 5a74 4600 6973 4754 455f 5f37 4e4f
4133360  626a 6563 7446 5036 4f62 6a65 6374 3a66 2830 2c31 2900 5f5f 3074 6869 733a 7028 302c 3836 2900 5f5f 305f 5f41 3338 3a70
4133440  2830 2c31 3138 2900 5f5f 3074 6869 7320 3a5a 746c 005f 5f30 5f5f 4133 3820 3a5a 746c 0069 7347 5445 5f5f 374e 4f62 6a65
4133520  6374 4650 364f 626a 6563 7420 3a5a 7446 0073 6574 5072 6f70 5f5f 374e 4f62 6a65 6374 4650 6366 3a66 2830 2c32 2900 5f5f
```

```
4133600 3074 6869 733a 7028 302c 3836 2900 5f5f 315f 5f41 3336 3a70 2830 2c32 3029 005f 5f31 5f5f 4133 373a 7028 302c 3130 2900
4133660 5f5f 3074 6869 7320 3a5a 746c 005f 5f31 5f5f 4133 3620 3a5a 746c 005f 5f31 5f5f 4133 3720 3a5a 746c 0073 6574 5072 6f70
4133740 5f5f 374e 4f62 6a65 6374 4650 6366 203a 5a74 4600 7365 7450 726f 705f 5f37 4e4f 626a 6563 7446 5063 693a 6628 302c 3229
4134020 005f 5f30 7468 6973 3a70 2830 2c38 3629 005f 5f31 5f5f 4133 343a 7028 302c 3230 2900 5f5f 315f 5f41 3335 3a70 2830 2c31
4134100 2900 5f5f 3074 6869 7320 3a5a 746c 005f 5f31 5f5f 4133 3420 3a5a 746c 005f 5f31 5f5f 4133 3520 3a5a 746c 0073 6574 5072
4134160 6f70 5f5f 374e 4f62 6a65 6374 4650 6369 203a 5a74 4600 7365 7450 726f 705f 5f37 4e4f 626a 6563 7446 5063 5431 3a66 2830
4134240 2c32 2900 5f5f 3074 6869 733a 7028 302c 3836 2900 5f5f 315f 5f41 3332 3a70 2030 2c32 3029 005f 5f31 5f5f 4133 333a 7028
4134320 302c 3230 2900 5f5f 3074 6869 7320 3a5a 746c 005f 5f31 5f5f 4133 3220 3a5a 746c 005f 5f31 5f5f 4133 3320 3a5a 746c 0073
4134400 6574 5072 6f70 5f5f 374e 4f62 6a65 6374 4650 6354 3120 3a5a 7446 0067 6574 5072 6f70 5f5f 374e 4f62 6a65 6374 4650 6369
4134460 3a66 2830 2c32 3029 005f 5f30 7468 6973 3a70 2830 2c38 3629 005f 5f30 5f5f 4133 303a 7028 302c 3230 2900 5f5f 305f 5f41
4134540 3331 3a70 2830 2c31 2900 5f5f 3074 6869 7320 3a5a 746c 005f 5f30 5f5f 4133 3020 3a5a 746c 005f 5f30 5f5f 4133 3120 3a5a
4134620 746c 0067 6574 5072 6f70 5f5f 374e 4f62 6a65 6374 4650 6369 203a 5a74 4600 6765 7441 7474 725f 5f37 4e4f 626a 6563 7446
4134700 693a 6628 302c 3230 2900 5f5f 3074 6869 733a 7028 302c 3836 2900 5f5f 305f 5f41 3239 3a70 2830 2c31 2900 5f5f 3074 6869
4134760 7320 3a5a 746c 005f 5f30 5f5f 4132 3920 3a5a 746c 0067 6574 4174 7472 5f5f 374e 4f62 6a65 6374 4669 203a 5a74 4600 696e
4135040 4f72 6465 725f 5f36 4f62 6a65 6374 4650 364f 626a 6563 743a 6628 302c 3129 005f 5f30 7468 6973 3a70 2830 2c31 3138 2900
4135120 5f5f 305f 5f41 3237 3a70 2830 2c31 3138 2900 2f68 6f6d 652f 6f73 6173 312f 612f 6162 2f73 7263 2f6e 6577 6f62 6a65 6374
4135200 732f 6878 782f 4f62 6a65 6374 5f64 622e 6878 7800 5f5f 3074 6869 7320 3a5a 746c 005f 5f30 5f5f 4132 3720 3a5a 746c 0069
4135260 6e4f 7264 6572 5f5f 364f 626a 6563 7446 5036 4f62 6a65 6374 203a 5a74 4600 4d47 5f53 7065 6369 6669 632e 6f00 5f70 7574
4135340 5f5f 376f 7374 7265 616d 4663 005f 696f 7374 7265 616d 5f69 6e69 7400 2f68 6f6d 652f 6f73 6173 312f 612f 6162 2f73 7263
4135420 2f6e 6577 6f62 6a65 6374 732f 7072 6f67 2f4d 472f 432b 2b2e 3232 3734 302f 004d 475f 5370 6563 6966 6963 2e63 004d 475f
4135500 5370 6563 6966 6963 2e63 7878 0069 6e74 3a74 2830 2c31 293d 7228 302c 3129 3b2d 3231 3437 3438 3336 3438 3b32 3134 3734
4135560 3833 3634 373b 0063 6861 723a 7428 302c 3229 3472 2830 2c32 293b 303b 3132 373b 006c 6f6e 673a 7428 302c 3329 3d72 2830
4135640 2c31 293b 2d32 3134 3734 3833 3634 383b 3231 3437 3438 3336 3437 3b00 7368 6f72 743a 7428 302c 3429 3d72 2830 2c31 293b
4135720 2d33 3237 3638 3b33 3237 3637 3b00 756e 7369 676e 6564 2063 6861 723a 7428 302c 3529 3d72 2830 2c31 293b 303b 3235 353b
4136000 0075 6e73 6967 6e65 6420 7368 6f72 743a 7428 302c 3629 3d72 2830 2c31 293b 303b 3635 3533 353b 0075 6e73 6967 6e65 6420
4136060 6c6f 6e67 3a74 2830 2c37 293d 7228 302c 3129 3b30 3b2d 313b 0075 6e73 6967 6e65 6420 696e 743a 7428 302c 3829 3d72 2830
4136140 2c31 293b 303b 2131 3b00 666c 6f61 743a 7428 302c 3929 3d72 2830 2c31 293b 343b 303b 0064 6f75 626c 653a 7428 302c 3130
4136220 293d 7228 302c 3129 3b38 3b30 3b00 766f 6964 3a74 2830 2c31 3129 3d28 302c 3131 2900 3f3f 3f3a 7428 302c 3132 293d 2830
4136300 2c31 2900 5f5f 7670 7470 3a74 2830 2c31 3329 3d2a 2830 2c31 3429 3d66 2830 2c31 2900 5f5f 6d70 7472 3a54 2830 2c31 3529
4136360 3d73 3864 3a28 302c 3429 2c30 2c31 363b 693a 2830 2c34 292c 3136 2c31 363b 663a 2830 2c31 3329 2c33 322c 3332 3b3b 005f
4136440 5046 565f 3a74 2830 2c31 3629 3d2a 2830 2c31 3729 3d66 2830 2c32 2900 5f50 4649 5f3a 7428 302c 3133 2900 6572 726e 6f3a
4136520 4728 302c 3129 0073 7973 5f6e 6572 723a 4728 302c 3129 0065 6e76 6972 6f6e 3a47 2830 2c31 3929 3d2a 2830 2c32 3029 3d2a
4136600 2830 2c32 2900 656e 643a 4728 302c 3129 0065 7465 7874 3a47 2830 2c31 2900 6564 6174 613a 4728 302c 3129 006f 7074 6172
4136660 673a 4728 302c 3230 2900 6f70 7469 6e64 3a47 2830 2c31 2900 6f70 7465 7272 3a47 2830 2c31 2900 7074 7264 6966 665f 743a
4136740 7428 302c 3129 0073 697a 655f 743a 7428 302c 3829 0073 7472 6561 6d70 6f73 3a74 2830 2c31 2900 7374 7265 616d 6f66 663a
4137020 7428 302c 3129 0069 6f5f 7374 6174 653a 5428 302c 3231 293d 6567 6f6f 6462 6974 5f5f 696f 5f73 7461 7465 3a30 2c65 6f66
4137100 6269 745f 5f69 6f5f 7374 6174 653a 312c 6661 696c 6269 745f 5f69 6f5f 7374 6174 653a 322c 6261 6462 6974 5f5f 696f 5f73
4137160 7461 7465 3a33 2c68 6172 6466 6169 6c5f 5f69 6f5f 7374 6174 653a 342c 3b00 6f70 656e 5f6d 6f64 653a 5428 302c 3232 293d
4137240 6569 6e5f 5f6f 7065 6e5f 6d6f 6465 3a30 2c6f 7574 5f5f 6f70 656e 5f6d 6f64 653a 312c 6174 655f 5f6f 7065 6e5f 6d6f 6465
4137320 3a32 2c61 7070 5f5f 6f70 656e 5f6d 6f64 653a 332c 7472 756e 635f 5f6f 7065 6e5f 6d6f 6465 3a34 2c6e 6f63 7265 6174 655f
4137400 5f6f 7065 6e5f 6d6f 6465 3a35 2c6e 6f72 6570 6c61 6365 5f5f 6f70 656e 5f6d 6f64 653a 362c 3b00 7365 656b 5f64 6972 3a54
4137460 2830 2c32 3329 3165 6265 675f 5f73 6565 6b5f 6469 723a 302c 6375 725f 5f73 6565 6b5f 6469 723a 312c 656e 645f 5f73 6565
4137540 6b5f 6469 723a 322c 3b00 5f5f 4531 3a54 2830 2c32 3429 3d65 736b 6970 7773 5f5f 5f5f 4531 3a30 2c6c 6566 745f 5f5f 5f45
4137620 313a 312c 7269 6768 745f 5f5f 5f45 313a 322c 696e 7465 726e 616c 5f5f 5f5f 4531 3a33 2c64 6563 5f5f 5f5f 4531 3a34 2c6f
4137700 6374 5f5f 5f5f 4531 3a35 2c68 6578 5f5f 5f5f 4531 3a36 2c73 686f 7762 6173 655f 5f5f 5f45 313a 372c 5c00 7368 6f77 706f
4137760 696e 745f 5f5f 5f45 313a 382c 7570 7065 7263 6173 655f 5f5f 5f45 313a 392c 7368 6f77 706f 735f 5f5f 5f45 313a 3130 2c73
4140040 6369 656e 7469 6669 635f 5f5f 5f45 313a 3131 2c66 6978 6564 5f5f 5f5f 4531 3a31 322c 756e 6974 6275 665f 5f5f 5f45 313a
4140120 3133 2c73 7464 696f 5f5f 5f5f 4531 3a31 342c 3b00 5f5f 4532 3a54 2830 2c32 3529 3d65 736b 6970 7069 6e67 5f5f 5f5f 4532
4140200 3a30 2c74 6965 645f 5f5f 5f45 323a 312c 3b00 696f 733a 5428 302c 3236 293d 7336 306e 7573 6572 5f5f 3369 6f73 3a28 302c
4140260 3129 2c30 2c33 323b 785f 7573 6572 5f5f 3369 6f73 3a28 302c 3330 293d 2a28 302c 3237 293d 7875 696f 735f 7573 6572 5f75
4140340 6e69 6f6e 3a2c 3332 2c33 323b 6270 5f5f 3369 6f73 3a28 302c 3331 293d 2a28 302c 3238 293d 7873 7374 7265 616d 6275 663a
4140420 2c36 342c 3332 3b73 7461 7465 5f5f 3369 6f73 3a28 302c 3129 2c39 362c 3332 3b69 7370 6563 6961 6c5f 5f33 696f 733a 2830
4140500 2c31 292c 3132 382c 3332 3b6f 7370 6563 6961 6c5f 5f33 696f 733a 2830 2c31 292c 3136 302c 3332 3b69 7366 785f 7370 6563
4140560 6961 6c5f 5f33 696f 733a 2830 2c31 292c 3139 322c 3332 3b6f 7366 785f 7370 6563 6961 6c5f 5f33 696f 733a 2830 2c31 292c
4140640 3232 342c 3332 3b5c 0064 656c 6275 665f 5f33 696f 733a 2830 2c31 292c 3235 362c 3332 3b78 5f74 6965 5f5f 3369 6f73 3a28
```

4140720 302c 3332 293d 2a28 302c 3239 293d 7873 6f73 7472 6561 6d3a 2c32 383d 2c33 323b 785f 666c 6167 735f 5f33 696f 733a 2830
4141000 2c31 292c 3332 302c 3332 3b78 5f70 7265 6369 7369 6f6e 5f5f 3369 6f73 3a28 302c 3429 2c33 3532 2c31 363b 785f 6669 6c6c
4141060 5f5f 3369 6f73 3a28 302c 3229 2c33 3638 2c38 3b78 5f77 6964 7468 5f5f 3369 6f73 3a28 302c 3429 2c33 3834 2c31 363b 6173
4141140 7369 676e 5f70 7269 7661 7465 5f5f 3369 6f73 3a28 302c 3129 2c34 3136 2c33 323b 5f5f 7670 7472 5f5f 3369 6f73 3a28 302c
4141220 3333 293d 2a28 302c 3135 292c 3434 382c 3332 3b3b 0062 6173 6566 6965 6c64 5f5f 3369 6f73 3a47 2830 2c31 2900 6164 6a75
4141300 7374 6669 656c 645f 5f33 696f 733a 4728 302c 3129 0066 6c6f 6174 6669 656c 645f 5f33 696f 733a 4728 302c 3129 006e 6578
4141360 7462 6974 5f5f 3369 6f73 3a47 2830 2c31 2900 6e65 7874 776f 7264 5f5f 3369 6f73 3a47 2830 2c31 2900 7374 6469 6f66 6c75
4141440 7368 5f5f 3369 6f73 3a47 2830 2c31 3629 0069 6f73 3a5a 6369 6f73 3b3b 5f5f 6374 5f5f 3369 6f73 4650 3973 7472 6561 6d62
4141520 7566 205f 5f63 745f 5f33 696f 7346 7620 5f5f 6374 5f5f 3369 6f73 4652 3369 6f73 205f 5f64 745f 5f33 696f 7346 7620 666c
4141600 6167 735f 5f33 696f 7346 7620 666c 6167 735f 5f33 696f 7346 6c20 7365 7466 5f5f 3369 6f73 466c 5431 2073 6574 665f 5f33
4141660 696f 7346 6c20 756e 7365 7466 5f5f 3369 6f73 466c 2077 6964 7468 5f5f 3369 6f73 4676 2077 6964 7468 5f5f 3369 6f73 4669
4141740 2074 6965 5f5f 3369 6f73 4650 376f 7374 7265 616d 205c 0074 6965 5f5f 3369 6f73 4676 2066 696c 6c5f 5f33 696f 7346 6320
4142020 6669 6c6c 5f5f 3369 6f73 4676 2070 7265 6369 7369 6f6e 5f5f 3369 6f73 4669 2070 7265 6369 7369 6f6e 5f5f 3369 6f73 4676
4142100 2072 6473 7461 7465 5f5f 3369 6f73 4676 205f 5f6f 7050 765f 5f33 696f 7346 7620 5f5f 6e74 5f5f 3369 6f73 4676 2065 6f66
4142160 5f5f 3369 6f73 4676 2066 6169 6c5f 5f33 696f 7346 7620 6261 645f 5f33 696f 7346 7620 576f 6f64 5f5f 3369 6f73 4676 2063
4142240 6c65 6172 5f5f 3369 6f73 4669 2072 6462 7566 5f5f 3369 6f73 4676 205c 0069 776f 7264 5f5f 3369 6f73 4669 2070 776f 7264
4142320 5f5f 3369 6f73 4669 2062 6974 616c 6c6f 635f 5f33 696f 7353 4676 2078 616c 6c6f 635f 5f33 696f 7353 4676 2075 7265 7369
4142400 7a65 5f5f 3369 6f73 4669 2073 796e 635f 7763 7468 5f73 7464 696f 5f5f 3369 6f73 5346 7620 7365 7473 7461 7465 5f5f 3369
4142460 6f73 4669 2069 6e69 745f 5f33 696f 7346 5039 7374 7265 616d 6275 6620 5f5f 6173 5f5f 3369 6f73 4652 3369 6f73 2073 6b69
4142540 705f 5f33 696f 7346 6920 3b62 6173 6566 6965 6c64 5f5f 3369 6f73 205c 0061 646a 7573 7466 6965 6c64 5f5f 3369 6f73 2066
4142620 6c6f 6174 6669 656c 645f 5f33 696f 7320 6e65 7874 6269 745f 5f33 696f 7320 6e65 7874 776f 7264 5f5f 3369 6f73 2073 7464
4142700 696f 666c 7573 685f 5f33 696f 7320 3b3b 0073 7472 6561 6d62 7566 3a54 2830 2c32 3829 3d73 3430 616c 6c6f 635f 5f39 7374
4142760 7265 616d 6275 663a 2830 2c34 292c 302c 3136 3b78 5f75 6e62 7566 5f5f 3973 7472 6561 6d62 7566 3a28 302c 3429 2c31 362c
4143040 3136 3b78 5f62 6173 655f 5f39 7374 7265 616d 6275 663a 2830 2c32 3029 2c33 322c 3332 3b78 5f70 6261 7365 5f5f 3973 7472
4143120 6561 6d62 7566 3a28 302c 3230 292c 3634 2c33 323b 785f 7070 7472 5f5f 3973 7472 6561 6d62 7566 3a28 302c 3230 292c 3936
4143200 2c33 323b 785f 6570 7074 725f 5f39 7374 7265 616d 6275 663a 2830 2c32 3029 2c31 3238 2c33 323b 785f 6770 7472 5f5f 3973
4143260 7472 6561 6d62 7566 3a28 302c 3230 292c 3136 302c 3332 3b78 5f65 6770 7472 5f5f 3973 7472 6561 6d62 7566 3a28 302c 3230
4143340 292c 3139 322c 3332 3b5c 0078 5f65 6261 636b 5f5f 3973 7472 6561 6d62 7566 3a28 302c 3230 292c 3232 342c 3332 3b78 5f62
4143420 6c65 6e5f 5f39 7374 7265 616d 6275 663a 2830 2c31 292c 3235 362c 3332 3b5f 5f76 7074 725f 5f39 7374 7265 616d 6275 663a
4143500 2830 2c33 3329 2c32 3838 2c33 323b 3b00 7374 7265 616d 6275 663a 5a63 7374 7265 616d 6275 663b 3b5f 5f63 745f 5f39 7374
4143560 7265 616d 6275 6646 5239 7374 7265 616d 6275 6620 5f5f 6374 5f5f 3973 7472 6561 6d62 7566 4676 205f 5f63 745f 5f39 7374
4143640 7265 616d 6275 6646 5063 6920 5f5f 6374 5f5f 3973 7472 6561 6d62 7566 4650 6369 5432 205f 5f61 735f 5f39 7374 7265 616d
4143720 6275 6646 5239 7374 7265 616d 6275 6620 6462 705f 5f39 7374 7265 616d 6275 6646 7620 6261 7365 5f5f 3973 7472 6561 6d62
4144000 7566 4676 2070 6261 7365 5f5f 3973 7472 6561 6d62 7566 4676 205c 0070 7074 725f 5f39 7374 7265 616d 6275 6646 7620 6570
4144060 7074 725f 5f39 7374 7265 616d 6275 6646 7620 6770 7472 5f5f 3973 7472 6561 6d62 7566 4676 2065 6770 7472 5f5f 3973 7472
4144140 6561 6d62 7566 4676 2065 6261 636b 5f5f 3973 7472 6561 6d62 7566 4676 2065 6275 665f 5f39 7374 7265 616d 6275 6646 7620
4144220 626c 656e 5f5f 3973 7472 6561 6d62 7566 4676 2073 6574 705f 5f39 7374 7265 616d 6275 6646 5063 5431 2073 6574 675f 5f39
4144300 7374 7265 616d 6275 6646 5063 4e32 3120 7062 756d 705f 5f39 7374 7265 616d 6275 6646 6920 5c00 6762 756d 705f 5f39 7374
4144360 7265 616d 6275 6646 6920 7365 7462 5f5f 3973 7472 6561 6d62 7566 4650 6354 3169 2075 6e62 7566 6665 7265 645f 5f39 7374
4144440 7265 616d 6275 6646 7620 756e 6275 6666 6572 6564 5f5f 3973 7472 6561 6d62 7566 4669 2061 6c6c 6f63 6174 655f 5f39 7374
4144520 7265 616d 6275 6646 7620 646f 616c 6c6f 6361 7465 5f5f 3973 7472 6561 6d62 7566 4676 206f 7665 7266 6c6f 775f 5f39 7374
4144600 7265 616d 6275 6646 6920 756e 6465 7266 6c6f 775f 5f39 7374 7265 616d 6275 6646 7620 5c00 7062 6163 6b66 6169 6c5f 5f39
4144660 7374 7265 616d 6275 6646 6920 7379 6e63 5f5f 3973 7472 6561 6d62 7566 4676 2073 6565 6b6f 6666 5f5f 3973 7472 6561 6d62
4144740 7566 466c 3873 6565 6b5f 6469 7269 2073 6565 6b70 6f73 5f5f 3973 7472 6561 6d62 7566 466c 6920 7873 7075 746e 5f5f 3973
4145020 7472 6561 6d62 7566 4650 4363 6920 7873 6765 746e 5f5f 3973 7472 6561 6d62 7566 4650 6369 2069 6e5f 6176 6169 6c5f 5f39
4145100 7374 7265 616d 6275 6646 7620 6f75 745f 7761 6974 696e 675f 5f39 7374 7265 616d 6275 6646 7620 5c00 7367 6574 635f 5f39
4145160 7374 7265 616d 6275 6646 7620 736e 6578 7463 5f5f 3973 7472 6561 6d62 7566 4676 2073 6275 6d70 635f 5f39 7374 7265 616d
4145240 6275 6646 7620 7374 6f73 7363 5f5f 3973 7472 6561 6d62 7566 4676 2073 7075 7462 6163 6b63 5f5f 3973 7472 6561 6d62 7566
4145320 4663 2073 7075 7463 5f5f 3973 7472 6561 6d62 7566 4669 2073 7075 746e 5f5f 3973 7472 6561 6d62 7566 4650 4363 6920 7367
4145400 6574 6e5f 5f39 7374 7265 616d 6275 6646 5063 6920 7365 7462 7566 5f5f 3973 7472 6561 6d62 7566 4650 6369 205c 0073 6574
4145460 6275 665f 5f39 7374 7265 616d 6275 6646 5055 6369 2073 6574 6275 665f 5f39 7374 7265 616d 6275 6646 5063 6954 3220 5f5f
4145540 6474 5f5f 3973 7472 6561 6d62 7566 4676 2078 5f73 6e65 7874 635f 5f39 7374 7265 616d 6275 6646 7620 3b3b 3b00 6973 7472
4145620 6561 6d3a 5428 302c 3334 2931 7337 3278 5f67 636f 756e 745f 5f37 6973 7472 6561 6d3a 2830 2c31 292c 302c 3332 3b5f 5f76
4145700 7074 725f 5f37 6973 7472 6561 6d3a 2830 2c33 3329 2c33 322c 3332 3b50 696f 733a 2830 2c33 3529 3d2a 2830 2c32 3629 2c36
4145760 342c 3332 3b4f 696f 733a 2830 2c32 3629 2c39 362c 3438 303b 3b00 6973 7472 6561 6d3a 5a63 6973 7472 6561 6d3b 696f 733b

| | | | | | | | | | | | | | | | | | | | | | | | | |
|---|---|---|---|---|---|---|---|---|---|---|---|---|---|---|---|---|---|---|---|---|---|---|---|---|
| 4146040 | 5f5f | 6374 | 5f5f | 3769 | 7374 | 7265 | 616d | 4650 | 3973 | 7472 | 6561 | 6d62 | 7566 | 205f | 5f63 | 745f | 5f37 | 6973 | 7472 | 6561 | 6d46 | 7620 | 5f5f | 6374 |
| 4146120 | 5f5f | 3769 | 7374 | 7265 | 616d | 4650 | 3973 | 7472 | 6561 | 6d62 | 7566 | 6950 | 376f | 7374 | 7265 | 616d | 205f | 5f63 | 745f | 5f37 | 6973 | 7472 | 6561 | 6d46 |
| 4146200 | 6950 | 6354 | 3120 | 5f5f | 6374 | 5f5f | 3769 | 7374 | 7265 | 616d | 4669 | 5431 | 5037 | 6f73 | 7472 | 6561 | 6d20 | 5f5f | 6374 | 5f5f | 3769 | 7374 | 7265 | 616d |
| 4146260 | 4652 | 3769 | 7374 | 7265 | 616d | 205f | 5f64 | 745f | 5f37 | 6973 | 7472 | 6561 | 6d46 | 7620 | 5c00 | 6970 | 6678 | 5f5f | 3769 | 7374 | 7265 | 616d | 4669 | 2069 |
| 4146340 | 7366 | 785f | 5f37 | 6973 | 7472 | 6561 | 6d46 | 7620 | 7365 | 656b | 675f | 5f37 | 6973 | 7472 | 6561 | 6d46 | 6c20 | 7365 | 656b | 675f | 5f37 | 6973 | 7472 | 6561 |
| 4146420 | 6d46 | 6c39 | 7365 | 656b | 5f64 | 6972 | 2074 | 656c | 6c67 | 5f5f | 3769 | 7374 | 7265 | 616d | 4676 | 205f | 5f72 | 735f | 5f37 | 6973 | 7472 | 6561 | 6d46 | 5046 |
| 4146500 | 5237 | 6973 | 7472 | 6561 | 6d5f | 5237 | 6973 | 7472 | 6561 | 6d20 | 5f5f | 7273 | 5f5f | 3769 | 7374 | 7265 | 616d | 4650 | 4652 | 3369 | 6f73 | 5f52 | 3369 | 6f73 |
| 4146560 | 205f | 5f72 | 735f | 5f37 | 6973 | 7472 | 6561 | 6d46 | 5063 | 205f | 5f72 | 735f | 5f37 | 6973 | 7472 | 6561 | 6d46 | 5055 | 6320 | 5c00 | 5f5f | 7273 | 5f5f | 3769 |
| 4146640 | 7374 | 7265 | 616d | 4652 | 5563 | 205f | 5f72 | 735f | 5f37 | 6973 | 7472 | 6561 | 6d46 | 5263 | 205f | 5f72 | 735f | 5f37 | 6973 | 7472 | 6561 | 6d46 | 5273 | 205f |
| 4146720 | 5f72 | 735f | 5f37 | 6973 | 7472 | 6561 | 6146 | 5269 | 205f | 5f72 | 735f | 5f37 | 6973 | 7472 | 6561 | 6d46 | 526c | 205f | 5f72 | 735f | 5f37 | 6973 | 7472 | 6561 |
| 4147000 | 6d46 | 5255 | 7320 | 5f5f | 7273 | 5f5f | 3769 | 7374 | 7265 | 616d | 4652 | 5569 | 205f | 5f72 | 735f | 5f37 | 6973 | 7472 | 6561 | 6d46 | 5255 | 6c20 | 5f5f | 7273 |
| 4147060 | 5f5f | 3769 | 7374 | 7265 | 616d | 4652 | 6620 | 5f5f | 7273 | 5f5f | 3769 | 7374 | 7265 | 616d | 4652 | 6420 | 5f5f | 7273 | 5f5f | 3769 | 7374 | 7265 | 616d | 4650 |
| 4147140 | 3973 | 7472 | 6561 | 6d62 | 7566 | 205c | 0067 | 6574 | 5f5f | 3769 | 7374 | 7265 | 616d | 4650 | 6369 | 6320 | 6765 | 745f | 5f37 | 6973 | 7472 | 6561 | 6d46 | 5055 |
| 4147220 | 6369 | 6320 | 6765 | 745f | 5f37 | 6973 | 7472 | 6561 | 6d46 | 5239 | 7374 | 7265 | 616d | 6275 | 6663 | 2067 | 6574 | 5f5f | 3769 | 7374 | 7265 | 616d | 4652 | 5563 |
| 4147300 | 2067 | 6574 | 5f5f | 3769 | 7374 | 7265 | 616d | 4652 | 6320 | 6765 | 745f | 5f37 | 6973 | 7472 | 6561 | 6d46 | 7620 | 6765 | 746c | 696e | 655f | 5f37 | 6973 | 7472 |
| 4147360 | 6561 | 6d46 | 5063 | 6963 | 2067 | 6574 | 6c69 | 6e65 | 5f5f | 3769 | 7374 | 7265 | 616d | 4650 | 5563 | 6963 | 2070 | 6565 | 6b5f | 5f37 | 6973 | 7472 | 6561 | 6d46 |
| 4147440 | 7620 | 6967 | 6e6f | 7265 | 5f5f | 3769 | 7374 | 7265 | 616d | 4669 | 5431 | 205c | 0072 | 6561 | 645f | 5f37 | 6973 | 7472 | 6561 | 6d46 | 5063 | 6920 | 7265 | 6164 |
| 4147520 | 5f5f | 3769 | 7374 | 7265 | 616d | 4650 | 5563 | 6920 | 6763 | 6f75 | 6e74 | 5f5f | 3769 | 7374 | 7265 | 616d | 4676 | 2070 | 7574 | 6261 | 636b | 5f5f | 3769 | 7374 |
| 4147600 | 7265 | 616d | 4663 | 2073 | 796e | 635f | 5f37 | 6973 | 7472 | 6561 | 6d46 | 7620 | 646f | 5f69 | 7066 | 785f | 5f37 | 6973 | 7472 | 6561 | 6d46 | 6920 | 6561 | 7477 |
| 4147660 | 6869 | 7465 | 5f5f | 3769 | 7374 | 7265 | 616d | 4676 | 2078 | 6765 | 745f | 5f37 | 6973 | 7472 | 6561 | 6d46 | 5063 | 203b | 3b3b | 006f | 7374 | 7265 | 616d | 3a54 |
| 4147740 | 2830 | 2c32 | 3929 | 3d73 | 3638 | 5f5f | 7670 | 7472 | 5f5f | 376f | 7374 | 7265 | 616d | 3a28 | 302c | 3333 | 292c | 302c | 3332 | 3b50 | 696f | 733a | 2830 | 2c33 |
| 4150020 | 3529 | 2c33 | 322c | 3332 | 3b4f | 696f | 733a | 2830 | 2c32 | 3629 | 2c36 | 342c | 3438 | 303b | 3b00 | 6f73 | 7472 | 6561 | 6d3a | 5a63 | 6f73 | 7472 | 6561 | 6d3b |
| 4150100 | 696f | 733b | 5f5f | 6374 | 5f5f | 376f | 7374 | 7265 | 616d | 4650 | 3973 | 7472 | 6561 | 6d62 | 7566 | 205f | 5f63 | 745f | 5f37 | 6f73 | 7472 | 6561 | 6d46 | 7620 |
| 4150160 | 5f5f | 6374 | 5f5f | 376f | 7374 | 7265 | 616d | 4669 | 205f | 5f63 | 745f | 5f37 | 6f73 | 7472 | 6561 | 6d46 | 6950 | 6320 | 5f5f | 6374 | 5f5f | 376f | 7374 | 7265 |
| 4150240 | 616d | 4652 | 376f | 7374 | 7265 | 616d | 205f | 5f64 | 745f | 5f37 | 6f73 | 7472 | 6561 | 6d46 | 7620 | 6f70 | 6678 | 5f5f | 376f | 7374 | 7265 | 616d | 4676 | 206f |
| 4150320 | 7366 | 785f | 5f37 | 6f73 | 7472 | 6561 | 6d46 | 7620 | 666c | 7573 | 685f | 5f37 | 6f73 | 7472 | 6561 | 6d46 | 7620 | 5c00 | 7365 | 656b | 705f | 5f37 | 6f73 | 7472 |
| 4150400 | 6561 | 6d46 | 6c20 | 7365 | 656b | 705f | 5f37 | 6f73 | 7472 | 6561 | 6d46 | 6c39 | 7365 | 656b | 5f64 | 6972 | 2074 | 656c | 6c70 | 5f5f | 376f | 7374 | 7265 | 616d |
| 4150460 | 4676 | 2070 | 7574 | 5f5f | 376f | 7374 | 7265 | 616d | 4663 | 205f | 5f6c | 735f | 5f37 | 6f73 | 7472 | 6561 | 6d46 | 6320 | 5f5f | 6c73 | 5f5f | 376f | 7374 | 7265 |
| 4150540 | 616d | 4655 | 6320 | 5f5f | 6c73 | 5f5f | 376f | 7374 | 7265 | 616d | 4650 | 4363 | 205f | 5f6c | 735f | 5f37 | 6f73 | 7472 | 6561 | 6d46 | 6920 | 5f5f | 6c73 | 5f5f |
| 4150620 | 376f | 7374 | 7265 | 616d | 466c | 205f | 5f6c | 735f | 5f37 | 6f73 | 7472 | 6561 | 6d46 | 6420 | 5f5f | 6c73 | 5f5f | 376f | 7374 | 7265 | 616d | 4666 | 205c | 005f |
| 4150700 | 5f6c | 735f | 5f37 | 6f73 | 7472 | 6561 | 6146 | 5569 | 205f | 5f6c | 735f | 5f37 | 6f73 | 7472 | 6561 | 6d46 | 556c | 205f | 5f6c | 735f | 5f37 | 6f73 | 7472 | 6561 |
| 4150760 | 6d46 | 5076 | 205f | 5f6c | 735f | 5f37 | 6f73 | 7472 | 6561 | 6d46 | 5039 | 7374 | 7265 | 616d | 6275 | 6620 | 5f5f | 6c73 | 5f5f | 376f | 7374 | 7265 | 616d | 4673 |
| 4151040 | 205f | 5f6c | 735f | 5f37 | 6f73 | 7472 | 6561 | 6d46 | 5573 | 205f | 5f6c | 735f | 5f37 | 6f73 | 7472 | 6561 | 6d46 | 5046 | 5237 | 6f73 | 7472 | 6561 | 6d5f | 5237 |
| 4151120 | 6f73 | 7472 | 6561 | 6d20 | 5f5f | 6c73 | 5f5f | 376f | 7374 | 7265 | 616d | 4650 | 4652 | 3369 | 6f73 | 5f52 | 3369 | 6f73 | 2077 | 7269 | 7465 | 5f5f | 376f | 7374 |
| 4151200 | 7265 | 616d | 4650 | 4363 | 6920 | 5c00 | 7772 | 6974 | 655f | 5f37 | 6f73 | 7472 | 6561 | 6d46 | 5043 | 5563 | 6920 | 646f | 5f6f | 7056 | 785f | 5f37 | 6f73 | 7472 |
| 4151260 | 6561 | 6d46 | 7620 | 646f | 5f6f | 7366 | 785f | 5f37 | 6f73 | 7472 | 6561 | 6d46 | 7620 | 3b3b | 3b00 | 7075 | 745f | 5f37 | 6f73 | 7472 | 6561 | 6d46 | 633a | 6628 |
| 4151340 | 302c | 3336 | 293d | 2a28 | 302c | 3239 | 2900 | 5f5f | 3074 | 6969 | 733a | 7028 | 302c | 3336 | 2900 | 5f5f | 3063 | 3a70 | 2830 | 2c32 | 2900 | 2f75 | 7372 | 2f43 |
| 4151420 | 432f | 7375 | 6e34 | 2f69 | 6e63 | 6c2f | 696f | 7374 | 7265 | 616d | 2e68 | 005f | 5f30 | 7468 | 6973 | 3a72 | 2830 | 2c33 | 3629 | 005f | 5f30 | 7468 | 6973 | 203a |
| 4151500 | 5a74 | 6c00 | 5f5f | 3063 | 203a | 5a74 | 6c00 | 7075 | 745f | 5f37 | 6f73 | 7472 | 6561 | 6d46 | 6320 | 3a5a | 7446 | 0069 | 6f73 | 7472 | 6561 | 6d3a | 5428 | 302c |
| 4151560 | 3337 | 293d | 7338 | 3078 | 5f67 | 636f | 756e | 745f | 5f37 | 6973 | 7472 | 6561 | 6d3a | 2830 | 2c31 | 292c | 302c | 3332 | 3b5f | 5f76 | 7074 | 725f | 5f37 | 6973 |
| 4151640 | 7472 | 6561 | 6d3a | 2830 | 2c33 | 3329 | 2c33 | 322c | 3332 | 3b50 | 696f | 733a | 2830 | 2c33 | 3529 | 2c36 | 342c | 3332 | 3b4f | 6f73 | 7472 | 6561 | 6d3a | 2830 |
| 4151720 | 2c32 | 3929 | 2c39 | 362c | 3534 | 343b | 3b00 | 696f | 7374 | 7265 | 616d | 3a5a | 6369 | 6f73 | 7472 | 6561 | 6d3b | 6973 | 7472 | 6561 | 6d20 | 6f73 | 7472 | 6561 |
| 4152000 | 6d20 | 696f | 733b | 5f5f | 6374 | 5f5f | 3869 | 6f73 | 7472 | 6561 | 6d46 | 5039 | 7374 | 7265 | 616d | 6275 | 6620 | 5f5f | 6374 | 5f5f | 3869 | 6f73 | 7472 | 6561 |
| 4152060 | 6d46 | 7620 | 5f5f | 6374 | 5f5f | 3869 | 6f73 | 7472 | 6561 | 6d46 | 5238 | 696f | 7374 | 7265 | 616d | 205f | 5f64 | 745f | 5f38 | 696f | 7374 | 7265 | 616d | 4676 |
| 4152140 | 203b | 3b3b | 0063 | 696e | 3a47 | 2830 | 2c33 | 3929 | 3378 | 7369 | 7374 | 7265 | 616d | 5f77 | 6974 | 6861 | 7373 | 6967 | 6e3a | 0063 | 6f75 | 743a | 4728 | 302c |
| 4152220 | 3339 | 293d | 7873 | 6f73 | 7472 | 6561 | 6d5f | 7769 | 7468 | 6173 | 7369 | 676e | 3a00 | 6365 | 7272 | 3a47 | 2830 | 2c33 | 3929 | 0063 | 6c6f | 673a | 4728 | 302c |
| 4152300 | 3339 | 2900 | 496f | 7374 | 7265 | 616d | 5f69 | 6e69 | 743a | 5428 | 302c | 3430 | 293d | 7331 | 5f5f | 5739 | 5f5f | 3133 | 496f | 7374 | 7265 | 616d | 5f69 | 6e69 |
| 4152360 | 743a | 2830 | 2c32 | 292c | 302c | 383b | 3b00 | 7374 | 6473 | 7461 | 7475 | 735f | 5f31 | 3349 | 6f73 | 7472 | 6561 | 6d5f | 696e | 6974 | 3a47 | 2830 | 2c31 | 2900 |
| 4152440 | 696e | 6974 | 636f | 756e | 745f | 5f31 | 3349 | 6f73 | 7472 | 6561 | 6d5f | 696e | 6974 | 3a47 | 2830 | 2c31 | 2900 | 496f | 7374 | 7265 | 616d | 5f69 | 6e69 | 743a |
| 4152520 | 5a63 | 496f | 7374 | 7265 | 616d | 5f69 | 6e69 | 743b | 3b5f | 5f63 | 745f | 5f31 | 3349 | 6f73 | 7472 | 6561 | 6d5f | 696e | 6974 | 4676 | 205f | 5f64 | 745f | 5f31 |
| 4152600 | 3349 | 6f73 | 7472 | 6561 | 6d5f | 696e | 6974 | 4676 | 203b | 7374 | 6473 | 7461 | 7475 | 735f | 5f31 | 3349 | 6f73 | 7472 | 6561 | 6d5f | 696e | 6974 | 2069 | 6e69 |
| 4152660 | 7463 | 6f75 | 6e74 | 5f5f | 3133 | 496f | 7374 | 7265 | 616d | 5f69 | 6e69 | 7420 | 3b40 | 696f | 733b | 0069 | 6f73 | 7472 | 6561 | 6d5f | 696e | 6974 | 3a53 | 2830 |
| 4152740 | 2c34 | 3029 | 0047 | 5054 | 3a74 | 2830 | 2c31 | 3329 | 0073 | 6d61 | 6e69 | 705f | 696e | 743a | 5428 | 302c | 3431 | 293d | 7338 | 6663 | 745f | 5f31 | 3073 | 6d61 |
| 4153020 | 6e69 | 705f | 696e | 743a | 2830 | 2c34 | 3229 | 3d2a | 2830 | 2c34 | 3329 | 3d66 | 2830 | 2c33 | 3529 | 2c30 | 2c33 | 323b | 6172 | 675f | 5f31 | 3073 | 6d61 | 6e69 |
| 4153100 | 705f | 696e | 743a | 2830 | 2c31 | 292c | 3332 | 2c33 | 323b | 3b00 | 736d | 616e | 6970 | 5f69 | 6e74 | 3a5a | 6373 | 6d61 | 6e69 | 705f | 696e | 743b | 3b5f | 5f63 |

```
4153160  745f 5f31 3073 6d61 6e69 705f 696e 7446 5046 5233 696f 7369 5f52 3369 6f73 6920 3b3b 5f5f 6c73 5f5f 4652 376f 7374 7265
4153240  616d 5231 3073 6d61 6e69 705f 696e 7420 5f5f 7273 5f5f 4652 3769 7374 7265 616d 5231 3073 6d61 6e69 705f 696e 7420 3b00
4153320  7361 7070 6c79 5f69 6e74 3a54 2830 2c34 3429 3373 3466 6374 5f5f 3130 7361 7070 6c79 5f69 6e74 3a28 302c 3432 292c 302c
4153400  3332 3b3b 0073 6170 706c 795f 696e 743a 5a63 7361 7070 6c79 5f69 6e74 3b3b 5f5f 6374 5f5f 3130 7361 7070 6c79 5f69 6e74
4153460  4650 4652 3369 6f73 695f 5233 696f 7320 5f5f 636c 5f5f 3130 7361 7070 6c79 5f69 6e74 4669 203b 3b3b 0069 6d61 6e69 705f
4153540  696e 743a 5428 302c 3435 293d 7338 6663 745f 5f31 3069 6d61 6e69 705f 696e 743a 2830 2c34 3629 3d2a 2830 2c34 3729 3d66
4153620  2830 2c34 3829 3d2a 2830 2c33 3429 2c30 2c33 323b 6172 675f 5f31 3069 6d61 6e69 705f 696e 743a 2830 2c31 292c 3332 2c33
4153700  323b 3b00 696d 616e 6970 5f69 6e74 3a5a 6369 6d61 6e69 705f 696e 743b 3b5f 5f63 745f 5f31 3069 6161 6e69 705f 696e 7446
4153760  5046 5237 6973 7472 6561 6d69 5f52 3769 7374 7265 616d 6920 3b3b 5f5f 7273 5f5f 4652 3769 7374 7265 616d 5231 3069 6d61
4154040  6e69 705f 696e 7420 3b00 6961 7070 6c79 5f69 6e74 3a54 2830 2c34 3929 3d73 3466 6374 5f5f 3130 6961 7070 6c79 5f69 6e74
4154120  3a28 302c 3436 292c 302c 3332 3b3b 0069 6170 706c 795f 696e 743a 5a63 6961 7070 6c79 5f69 6e74 3b3b 5f5f 6374 5f5f 3130
4154200  6961 7070 6c79 5f69 6e74 4650 4652 3769 7374 7265 616d 695f 5237 6973 7472 6561 6d20 5f5f 636c 5f5f 3130 6961 7070 6c79
4154260  5f69 6e74 4669 203b 3b3b 006f 6d61 6e69 705f 696e 743a 5428 302c 3530 293d 7338 6663 745f 5f31 306f 6d61 6e69 705f 696e
4154340  743a 2830 2c35 3129 3d2a 2830 2c35 3229 3d66 2830 2c33 3629 2c30 2c33 323b 6172 675f 5f31 306f 6d61 6e69 705f 696e 743a
4154420  2830 2c31 292c 3332 2c33 323b 3b00 6f6d 616e 6970 5f69 6e74 3a5a 636f 6d61 6e69 705f 696e 743b 3b5f 5f63 745f 5f31 306f
4154500  6161 6e69 705f 696e 7446 5046 5237 6f73 7472 6561 6d69 5f52 376f 7374 7265 616d 6920 3b3b 5f5f 6c73 5f5f 4652 376f 7374
4154560  7265 616d 5231 306f 6d61 6e69 705f 696e 7420 3b00 6f61 7070 6c79 5f69 6e74 3a54 2830 2c35 3329 3d73 3466 6374 5f5f 3130
4154640  6f61 7070 6c79 5f69 6e74 3a28 302c 3531 292c 302c 3332 3b3b 006f 6170 706c 795f 696e 743a 5a63 6f61 7070 6c79 5f69 6e74
4154720  3b3b 5f5f 6374 5f5f 3130 6f61 7070 6c79 5f69 6e74 4650 4652 376f 7374 7265 616d 695f 5237 6f73 7472 6561 6d20 5f5f 636c
4155000  5f5f 3130 6f61 7070 6c79 5f69 6e74 4669 203b 3b3b 0069 6f6d 616e 6970 5f69 6e74 3a54 2830 2c35 3429 3d73 3866 6374 5f5f
4155060  3131 696f 6d61 6e69 705f 696e 743a 2830 2c35 3529 3d2a 2830 2c35 3629 3d66 2830 2c35 3729 3d2a 2830 2c33 3729 2c30 2c33
4155140  323b 6172 675f 5f31 3169 6f6d 616e 6970 5f69 6e74 3a28 302c 3129 2c33 322c 3332 3b3b 0069 6f6d 616e 6970 5f69 6e74 3a5a
4155220  6369 6f6d 616e 6970 5f69 6e74 3b3b 5f5f 6374 5f5f 3131 696f 6d61 6e69 705f 696e 7446 5046 5238 696f 7374 7265 616d 695f
4155300  5238 696f 7374 7265 616d 6920 3b3b 5f5f 6c73 5f5f 4652 3869 6f73 7472 6561 6d52 3131 696f 6d61 6e69 705f 696e 7420 5f5f
4155360  7273 5f5f 4652 3369 6f73 7472 6561 6d52 3131 696f 6d61 6e69 705f 696e 7420 3b00 696f 6170 706c 795f 696e 743a 5428 302c
4155440  3538 293d 7334 6663 745f 5f31 3169 6f61 7070 6c79 5f69 6e74 3a28 302c 3535 292c 302c 3332 3b3b 0069 6f61 7070 6c79 5f69
4155520  6e74 3a5a 6369 6f61 7070 6c79 5f69 6e74 3b3b 5f5f 6374 5f5f 3131 696f 6170 706c 795f 696e 7446 5046 5238 696f 7374 7265
4155600  616d 695f 5238 696f 7374 7265 616d 205f 5f63 6c5f 5f31 3169 6f61 7070 6c79 5f69 6e74 4669 203b 3b3b 0073 6d61 6e69 705f
4155660  6c6f 6e67 3a54 2830 2c35 3929 3d73 3866 6374 5f5f 3131 736d 616e 6970 5f6c 6f6e 673a 2830 2c34 3229 2c30 2c33 323b 6172
4155740  675f 5f31 3173 6d61 6e69 705f 6c6f 6e67 3a28 302c 3129 2c33 322c 3332 3b3b 0073 6d61 6e69 705f 6c6f 6e67 3a5a 6373 6d61
4156020  6e69 705f 6c6f 6e67 3b3b 5f5f 6374 5f5f 3131 736d 616e 6970 5f6c 6f6e 6746 5046 5233 696f 736c 5f52 3369 6f73 6c20 3b3b
4156100  5f5f 6c73 5f5f 4652 376f 7374 7265 616d 5231 3173 6d61 6e69 705f 6c6f 6e67 205f 5f72 735f 5f46 5237 6973 7472 6561 6d52
4156160  3131 736d 616e 6970 5f6c 6f6e 6720 3b00 7361 7070 6c79 5f6c 6f6e 673a 5428 302c 3630 293d 7334 6663 745f 5f31 3173 6170
4156240  706c 795f 6c6f 6e67 3a28 302c 3432 292c 302c 3332 3b3b 0073 6170 706c 795f 6c6f 6e67 3a5a 6373 6170 706c 795f 6c6f 6e67
4156320  3b3b 5f5f 6374 5f5f 3131 7361 7070 6c79 5f6c 6f6e 6746 5046 5233 696f 736c 5f52 3369 6f73 205f 5f63 6c5f 5f31 3173 6170
4156400  706c 795f 6c6f 6e67 466c 203b 3b3b 0069 6d61 6e69 705f 6c6f 6e67 3a54 2830 2c36 3129 3d73 3866 6374 5f5f 3131 696d 616e
4156460  6970 5f6c 6f6e 673a 2830 2c34 3629 2c30 2c33 323b 6172 675f 5f31 3169 6d61 6e69 705f 6c6f 6e67 3a28 302c 3129 2c33 322c
4156540  3332 3b3b 0069 6d61 6e69 705f 6c6f 6e67 3a5a 6369 6d61 6e69 705f 6c6f 6e67 3b3b 5f5f 6374 5f5f 3131 696d 616e 6970 5f6c
4156620  6f6e 6746 5046 5237 6973 7472 6561 6d6c 5f52 3769 7374 7265 616d 6c20 3b3b 5f5f 7273 5f5f 4652 3769 7374 7265 616d 5231
4156700  3169 6d61 6e69 705f 6c6f 6e67 203b 0069 6170 706c 795f 6c6f 6e67 3a54 2830 2c36 3229 3d73 3466 6374 5f5f 3131 6961 7070
4156760  6c79 5f6c 6f6e 673a 2830 2c34 3629 2c30 2c33 323b 3b00 6961 7070 6c79 5f6c 6f6e 673a 5a63 6961 7070 6c79 5f6c 6f6e 673b
4157040  3b5f 5f63 745f 5f31 3169 6170 706c 795f 6c6f 6e67 4650 4652 3769 7374 7265 616d 6c5f 5237 6973 7472 6561 6d20 5f5f 636c
4157120  5f5f 3131 6961 7070 6c79 5f6c 6f6e 6746 6c20 3b3b 3b00 6f6d 616e 6970 5f6c 6f6e 673a 5428 302c 3633 293d 7338 6663 745f
4157200  5f31 316f 6d61 6e69 705f 6c6f 6e67 3a28 302c 3531 292c 302c 3332 3b61 7267 5f5f 3131 6f6d 616e 6970 5f6c 6f6e 673a 2830
4157260  2c31 292c 3332 2c33 323b 3b00 6f6d 616e 6970 5f6c 6f6e 673a 5a63 6f6d 616e 6970 5f6c 6f6e 673b 3b5f 5f63 745f 5f31 316f
4157340  6d61 6e69 705f 6c6f 6e67 4650 4652 376f 7374 7265 616d 6c5f 5237 6f73 7472 6561 6d6c 203b 3b5f 5f6c 735f 5f46 5237 6f73
4157420  7472 6561 6d52 3131 6f6d 616e 6970 5f6c 6f6e 6720 3b00 6f61 7070 6c79 5f6c 6f6e 673a 5428 302c 3634 293d 7334 6663 745f
4157500  5f31 316f 6170 706c 795f 6c6f 6e67 3a28 302c 3531 292c 302c 3332 3b3b 006f 6170 706c 795f 6c6f 6e67 3a5a 636f 6170 706c
4157560  795f 6c6f 6e67 3b3b 5f5f 6374 5f5f 3131 6f61 7070 6c79 5f6c 6f6e 6746 5046 5237 6f73 7472 6561 6d6c 5f52 376f 7374 7265
4157640  616d 205f 5f63 6c5f 5f31 316f 6170 706c 795f 6c6f 6e67 466c 203b 3b3b 0069 6f6d 616e 6970 5f6c 6f6e 673a 5428 302c 3635
4157720  293d 7338 6663 745f 5f31 3269 6f6d 616e 6970 5f6c 6f6e 673a 2930 2c35 3529 2c30 2c33 323b 6172 675f 5f31 3269 6f6d 616e
4160000  6970 5f6c 6f6e 673a 2830 2c31 292c 3332 2c33 323b 3b00 696f 6d61 6e69 705f 6c6f 6e67 3a5a 6369 6f6d 616e 6970 5f6c 6f6e
4160060  673b 3b5f 5f63 745f 5f31 3269 6f6d 616e 6970 5f6c 6f6e 6746 5046 5238 696f 7374 7265 616d 6c5f 5238 696f 7374 7265 616d
4160140  6c20 3b3b 5f5f 6c73 5f5f 4652 3969 6f73 7472 6561 6d52 3132 696f 6d61 6e69 705f 6c6f 6e67 205f 5f72 735f 5f46 5238 696f
4160220  7374 7265 616d 5231 3269 6f6d 616e 6970 5f6c 6f6e 6720 3b00 696f 6170 706c 795f 6c6f 6e67 3a54 2830 2c36 3629 3d73 3466
```

```
4160300 6374 5f5f 3132 696f 6170 706c 795f 6c6f 6e67 3a28 302c 3535 292c 302c 3332 3b3b 0069 6f61 7370 6c79 5f6c 6f6e 673a 5a63
4160360 696f 6170 706c 795f 6c6f 6e67 3b3b 5f5f 6374 5f5f 3132 696f 6170 706c 795f 6c6f 6e67 4650 4652 3869 6f73 7472 6561 6d6c
4160440 5f52 3869 6f73 7472 6561 6d20 5f5f 636c 5f5f 3132 696f 6170 706c 795f 6c6f 6e67 466c 203b 3b3b 0073 7464 696f 6275 663a
4160520 5428 302c 3637 293d 7335 3261 6c6c 6f63 5f5f 3973 7472 6561 6d62 7566 3a28 302c 3429 2c30 2c31 363b 785f 756e 6275 665f
4160600 5f39 7374 7265 616d 6275 663a 2830 2c34 292c 3136 2c31 363b 785f 6261 7365 5f5f 3973 7472 6561 6d62 7566 3a28 302c 3230
4160660 292c 3332 2c33 323b 785f 7062 6173 655f 5f39 7374 7265 616d 6275 663a 2830 2c32 3029 2c36 342c 3332 3b78 5f70 7074 725f
4160740 5f39 7374 7265 616d 6275 663a 2830 2c32 3029 2c39 362c 3332 3b78 5f65 7070 7472 5f5f 3973 7472 6561 6d62 7566 3a28 302c
4161020 3230 292c 3132 382c 3332 3b78 5f67 7074 725f 5f39 7374 7265 616d 6275 663a 2830 2c32 3029 2c31 3630 2c33 323b 735f 6567
4161100 7074 725f 5f39 7374 7265 616d 6275 663a 2830 2c32 3029 2c31 3932 2c33 323b 5c00 785f 6562 6163 6b5f 5f39 7374 7265 616d
4161160 6275 663a 2830 2c32 3029 2c32 3234 2c33 323b 785f 626c 656e 5f5f 3973 7472 6561 6d62 7566 3a28 302c 3129 2c32 3536 2c33
4161240 323b 5f5f 7670 7472 5f5f 3973 7472 6561 6d62 7566 3a28 302c 3333 292c 3238 382c 3332 3b66 705f 5f38 7374 6469 6f62 7566
4161320 3a28 302c 3638 293d 2a28 302c 3138 293d 7873 5f69 6f62 7566 3a2c 3332 302c 3332 3b6c 6173 745f 6f70 5f5f 3873 7464 696f
4161400 6275 663a 2830 2c31 292c 3335 322c 3332 3b62 7566 5f5f 3873 7464 696f 6275 663a 2830 2c36 3929 3361 7228 302c 3129 3b30
4161460 3b31 3b28 302c 3229 2c33 3834 2c31 363b 3b00 7374 6469 6f62 7566 3a5a 6373 7464 696f 6275 663b 7374 7265 616d 6275 663b
4161540 6f76 6572 666c 6f77 5f5f 3873 7464 696f 6275 6646 6920 756e 6465 7266 6c6f 775f 5f38 7374 6469 6f62 7566 4676 2073 796e
4161620 635f 5f38 7374 6469 6f62 7566 4676 2073 6565 6b6f 6666 5f5f 3873 7464 696f 6275 6646 6c38 7365 656b 5f64 6972 6920 7062
4161700 6163 6b66 6169 6c5f 5f38 7374 6469 6f62 7566 4669 205f 5f63 745f 5f38 7374 6469 6f62 7566 4650 365f 696f 6275 6620 5f5f
4161760 6374 5f5f 3873 7464 696f 6275 6646 5243 3873 7464 696f 6275 6620 5c00 7374 6469 6f66 696c 655f 5f38 7374 6469 6f62 7566
4162040 4676 205f 5f64 745f 5f38 7374 6469 6f62 7566 4676 203b 3b3b 0066 696c 6562 7566 3a54 2830 2c37 3029 3d73 3634 616c 6c6f
4162120 635f 5f39 7374 7265 616d 6275 663a 2830 2c34 292c 302c 3136 3b78 5f75 6e62 7566 5f5f 3973 7472 6561 6d62 7566 3a28 302c
4162200 3429 2c31 362c 3136 3b78 5f62 6173 655f 5f39 7374 7265 616d 6275 663a 2830 2c32 3029 2c33 322c 3332 3b78 5f70 6261 7365
4162260 5f5f 3973 7472 6561 6d62 7566 3a28 302c 3230 292c 3634 2c33 323b 795f 7070 7472 5f5f 3973 7472 6561 6d62 7566 3a28 302c
4162340 3230 292c 3936 2c33 323b 785f 6570 7074 725f 5f39 7374 7265 616d 6275 663a 2830 2c32 3029 2c31 3238 2c33 323b 785f 6770
4162420 7472 5f5f 3973 7472 6561 6d62 7566 3a28 302c 3230 292c 3136 302c 3332 3b78 5f65 6770 7472 5f5f 3973 7472 6561 6d62 7566
4162500 3a28 302c 3230 292c 3139 322c 3332 3b5c 0078 5f65 6261 636b 5f5f 3973 7472 6561 6d62 7566 3a28 302c 3230 292c 3232 342c
4162560 3332 3b78 5f62 6c65 6e5f 5f39 7374 7265 6163 6275 663a 2830 2c31 292c 3235 362c 3332 3b5f 5f76 7074 725f 5f39 7374 7265
4162640 616d 6275 663a 2330 2c33 3329 2c32 3038 2c33 323b 7866 645f 5f37 6669 6c65 6275 663a 2830 2c31 292c 3332 302c 3332 3b6d
4162720 6f64 655f 5f37 6669 6c65 6275 663a 2830 2c31 292c 3335 322c 3332 3b6f 7065 6e65 645f 5f37 6669 6c65 6275 663a 2830 2c32
4163000 292c 3336 342c 333b 6c61 7374 5f73 6565 6b5f 5f37 6669 6c65 6275 663a 2830 2c31 292c 3431 362c 3332 3b69 6e5f 7374 6172
4163060 745f 5f37 6669 6c65 6275 663a 2830 2c32 3029 2c34 3438 2c33 323b 6c61 6865 6164 5f5f 3766 696c 6562 7566 3a28 302c 3639
4163140 292c 3438 302c 3b3b 006f 7065 6e70 726f 745f 5f37 6669 6c65 6275 663a 4728 302c 3129 0066 696c 6562 7566 3a5a 6366
4163220 696c 6562 7566 3b73 7472 6561 6d62 7566 3b5f 5f63 745f 5f37 6669 6c65 6275 6646 7620 5f5f 6374 5f5f 3766 696c 6562 7566
4163300 4669 205f 5f63 745f 5f37 6669 6c65 6275 6646 6950 6354 3120 5f5f 6374 5f5f 3766 696c 6562 7566 4652 4337 6669 6c65 6275
4163360 6620 6973 5f6f 7065 6e5f 5f37 6669 6c65 6275 6646 7620 6664 5f5f 3766 696c 6562 7566 4676 206f 7065 6e5f 5f37 6669 6c65
4163440 6275 6646 5043 6369 5432 2061 7474 6163 685f 5f37 6669 6c65 6275 6646 6920 636c 6f73 655f 5f37 6669 6c65 6275 6646 7620
4163520 5c00 5f5f 6474 5f5f 3766 696c 6562 7566 4676 206f 7665 7266 6c6f 775f 5f37 6669 6c65 6275 6646 6920 756e 6465 7266 6c6f
4163600 775f 5f37 6669 6c65 6275 6646 7620 7379 6e63 5f5f 3766 696c 6562 7566 4676 2073 6565 6b6f 6666 5f5f 3766 696c 6562 7566
4163660 466c 3873 6565 6b5f 6469 7269 2073 6574 6275 665f 5f37 6669 6c65 6275 6646 5063 6920 6c61 7374 5f6f 705f 5f37 6669 6c65
4163740 6275 6646 7620 3b6f 7065 6e70 726f 745f 5f37 6669 6c65 6275 6620 3b3b 0066 7374 7265 616d 6261 7365 3a54 2830 2c37 3129
4164020 3d73 3133 3262 7566 5f5f 3131 6673 7472 6561 6d62 6173 653a 2830 2c37 3029 2c30 2c35 3132 3b5f 5f76 7074 725f 5f31 3166
4164100 7374 7265 616d 6261 7365 3a28 302c 3333 292c 3531 322c 3332 3b50 696f 733a 2830 2c33 3529 2c35 3434 2c33 323b 4f69 6f73
4164160 3a28 302c 3236 292c 3537 362c 3438 393b 3b00 6673 7472 6561 6d62 6173 653a 5a63 6673 7472 6561 6d62 6173 653b 696f 733b
4164240 5f5f 6374 5f5f 3131 6673 7472 6561 6d62 6173 6546 7620 5f5f 6374 5f5f 3131 6673 7472 6561 6d62 6173 6546 5043 6369 5432
4164320 205f 5f63 745f 5f31 3166 7374 7265 616d 6261 7365 4669 205f 5f63 745f 5f31 3166 7374 7265 616d 6261 7365 4669 5063 5431
4164400 205f 5f63 745f 5f31 3166 7374 7265 616d 6261 7365 4652 3131 6673 7472 6561 6d62 6173 6520 5f5f 6474 5f5f 3131 6673 7472
4164460 6561 6d62 6173 6546 7620 6f70 656e 5f5f 3131 6673 7472 6561 6d62 6173 6546 5043 6369 5432 205c 0061 7474 6163 685f 5f31
4164540 3166 7374 7265 616d 6261 7365 4669 2063 6c6f 7365 5f5f 3131 6673 7472 6561 6d62 6173 6546 7620 7365 7462 7566 5f5f 3131
4164620 6673 7472 6561 6d62 6173 6546 5063 6920 7264 6275 665f 5f31 3166 7374 7265 616d 6261 7365 4676 2076 6572 6966 795f 5f31
4164700 3166 7374 7265 616d 6261 7365 4669 203b 3b3b 0073 7461 7465 5f76 616c 7565 3a74 2830 2c32 3129 0056 616c 7565 5f54 7970
4164760 653a 5428 302c 3732 293d 6555 4e4b 4e4f 574e 563a 302c 5354 5249 4e47 3a31 2c49 4e54 4547 4552 3a32 2c46 4c4f 4154 3a33
4165040 2c3b 0042 6c6f 636b 5f54 7970 653a 5428 302c 3733 293d 6555 4e4b 4e4f 574e 423a 302c 454e 5449 5459 3a31 2c46 554e 4354
4165120 494f 4e3a 322c 5052 4f43 4544 5552 453a 332c 3b00 456e 7469 7479 5f54 7970 653a 5428 302c 3734 293d 6555 4e4b 4e4f 574e
4165200 453a 302c 4152 4348 4954 4543 5455 5245 3a31 2c53 5542 5052 4f47 5241 4d3a 322c 3b00 5069 6e5f 5479 7065 3a54 2830 2c37
4165260 3529 3d65 554e 4b4e 4f57 4e50 3a30 2c49 4e50 494e 3a31 2c4f 5554 5049 4e3a 322c 494e 4f55 5450 494e 3a33 2c3b 0050 6172
4165340 615f 436c 6173 733a 5428 302c 3736 293d 6555 4e4b 4e4f 574e 433a 302c 464f 524d 414c 3a31 2c41 4354 5541 4c3a 322c 5245
```

| | | | | | | | | | | | | | | | | | | | | | | | | |
|---|---|---|---|---|---|---|---|---|---|---|---|---|---|---|---|---|---|---|---|---|---|---|---|---|
| 4165420 | 534f | 4c56 | 4544 | 3133 | 2c3b | 0042 | 4f4f | 4c45 | 414e | 3a54 | 2830 | 2c37 | 3729 | 3d65 | 4661 | 6c73 | 653a | 302c | 5472 | 7565 | 3a31 | 2c3b | 0042 | 6f6f |
| 4165500 | 6c65 | 616e | 3a54 | 2830 | 2c37 | 3829 | 3d65 | 6661 | 6c73 | 653a | 302c | 7472 | 7565 | 3a31 | 2c3b | 0042 | 7566 | 6665 | 723a | 4728 | 302c | 3230 | 2900 | 4d47 |
| 4165560 | 5f53 | 7065 | 6369 | 6669 | 633a | 5428 | 302c | 3739 | 293d | 7331 | 3274 | 6563 | 686e | 6f6c | 6f67 | 795f | 5f31 | 314d | 475f | 5370 | 6563 | 6966 | 6963 | 3a28 |
| 4165640 | 302c | 3230 | 292c | 302c | 3332 | 3b6c | 6273 | 5f74 | 6563 | 684e | 756d | 5f5f | 3131 | 4d47 | 5f53 | 7065 | 6369 | 6669 | 633a | 2830 | 2c31 | 292c | 3332 | 2c33 |
| 4165720 | 323b | 4d65 | 6d5f | 7465 | 6368 | 4e75 | 6d5f | 5f31 | 314d | 475f | 5370 | 6563 | 6966 | 6963 | 3a28 | 302c | 3129 | 2c36 | 342c | 3332 | 3b3b | 004d | 475f | 5370 |
| 4166000 | 6563 | 6966 | 6963 | 3a5a | 634d | 475f | 5370 | 6563 | 6966 | 6963 | 3b3b | 5f5f | 6374 | 5f5f | 3131 | 4d47 | 5f53 | 7065 | 6369 | 6669 | 6346 | 7620 | 5f5f | 6474 |
| 4166060 | 5f5f | 3131 | 4d47 | 5f53 | 7065 | 6369 | 6669 | 6346 | 7620 | 7365 | 745f | 7465 | 6368 | 6e6f | 6c6f | 6779 | 5f6e | 616d | 655f | 5f31 | 314d | 475f | 5370 | 6563 |
| 4166140 | 6966 | 6963 | 4650 | 6320 | 6765 | 745f | 6c62 | 735f | 7465 | 6368 | 4e75 | 6d5f | 5f31 | 314d | 475f | 5370 | 6563 | 6966 | 6963 | 4676 | 2067 | 6574 | 5f4d | 656d |
| 4166220 | 5f74 | 6563 | 684e | 756d | 5f5f | 3131 | 4d47 | 5f53 | 7065 | 6369 | 6669 | 6346 | 7620 | 6765 | 745f | 7465 | 6368 | 4e61 | 6d65 | 5f5f | 3131 | 4d47 | 5f53 | 7065 |
| 4166300 | 6369 | 6669 | 6346 | 7620 | 5c00 | 6578 | 706c | 6169 | 6e5f | 5f31 | 314d | 475f | 5370 | 6563 | 6966 | 6963 | 4650 | 6320 | 3b3b | 3b00 | 6f73 | 7472 | 6561 | 6d5f |
| 4166360 | 7769 | 7468 | 6173 | 7369 | 676e | 3a54 | 2830 | 2c33 | 3929 | 3473 | 3638 | 5f5f | 7670 | 7472 | 5f5f | 376f | 7374 | 7265 | 616d | 3a28 | 302c | 3333 | 292c | 302c |
| 4166440 | 3332 | 3b50 | 696f | 733a | 2830 | 2c33 | 3529 | 2c33 | 322c | 3332 | 3b4f | 696f | 733a | 2830 | 2c32 | 3629 | 2c36 | 342c | 3438 | 303b | 3b00 | 6f73 | 7472 | 6561 |
| 4166520 | 6d5f | 7769 | 7468 | 6173 | 7369 | 676e | 3a5a | 636f | 7374 | 7265 | 616d | 5f77 | 6974 | 6861 | 7373 | 6967 | 6e3b | 6f73 | 7472 | 6561 | 6d20 | 696f | 733b | 5f5f |
| 4166600 | 6374 | 5f5f | 3138 | 6f73 | 7472 | 6561 | 6d5f | 7769 | 7468 | 6173 | 7369 | 676e | 4676 | 205f | 5f63 | 745f | 5f31 | 386f | 7374 | 7265 | 616d | 5f77 | 6974 | 6861 |
| 4166660 | 7373 | 6967 | 6e46 | 5231 | 386f | 7374 | 7265 | 616d | 5f77 | 6974 | 6861 | 7373 | 6967 | 6e20 | 5f5f | 6474 | 5f5f | 3138 | 6f73 | 7472 | 6561 | 6d5f | 7769 | 7468 |
| 4166740 | 6173 | 7369 | 676e | 4676 | 205f | 5f61 | 735f | 5f31 | 386f | 7374 | 7265 | 616d | 5f77 | 6974 | 6861 | 7373 | 6967 | 6e46 | 5237 | 6f73 | 7472 | 6561 | 6d20 | 5c00 |
| 4167020 | 5f5f | 6173 | 5f5f | 3138 | 6f73 | 7472 | 6561 | 6d5f | 7769 | 7468 | 6173 | 7369 | 676e | 4650 | 3973 | 7472 | 6561 | 6d62 | 7566 | 203b | 3b3b | 0073 | 6574 | 5f74 |
| 4167100 | 6563 | 686e | 6f6c | 6f67 | 795f | 6e61 | 6d65 | 5f5f | 3131 | 4d47 | 5f53 | 7065 | 6369 | 6669 | 6346 | 5063 | 3a46 | 2830 | 2c32 | 2900 | 5f5f | 3074 | 6869 | 733a |
| 4167160 | 7028 | 302c | 3830 | 293d | 2a28 | 302c | 3739 | 2900 | 5f5f | 3073 | 3a70 | 2830 | 2c32 | 3029 | 004d | 475f | 5370 | 6563 | 6966 | 6963 | 2e63 | 7878 | 005f | 5f30 |
| 4167240 | 7468 | 6973 | 3a72 | 2830 | 2c38 | 3029 | 005f | 5f30 | 7468 | 6973 | 203a | 5a74 | 6c00 | 5f5f | 3073 | 203a | 5a74 | 6c00 | 7365 | 745f | 7465 | 6368 | 6e6f | 6c6f |
| 4167320 | 6779 | 5f6e | 616d | 655f | 5f31 | 314d | 475f | 5370 | 6563 | 6966 | 6963 | 4650 | 6320 | 3a5a | 7446 | 0067 | 6574 | 5f6c | 6273 | 5f74 | 6563 | 684e | 756d | 5f5f |
| 4167400 | 3131 | 4d47 | 5f53 | 7065 | 6369 | 6669 | 6346 | 763a | 4628 | 302c | 3129 | 005f | 5f30 | 7468 | 6973 | 3a70 | 2830 | 2c38 | 3029 | 005f | 5f30 | 7468 | 6973 | 3a72 |
| 4167460 | 2830 | 2c38 | 3029 | 005f | 5f30 | 7468 | 6973 | 203a | 5a74 | 6c00 | 6765 | 745f | 6c62 | 735f | 7465 | 6368 | 4e75 | 6d5f | 5f31 | 314d | 475f | 5370 | 6563 | 6966 |
| 4167540 | 6963 | 4676 | 203a | 5a74 | 4600 | 6765 | 745f | 4d65 | 6d5f | 7465 | 6368 | 4e75 | 6d5f | 5f31 | 314d | 475f | 5370 | 6563 | 6966 | 6963 | 4676 | 3a46 | 2830 | 2c31 |
| 4167620 | 2900 | 5f5f | 3074 | 6869 | 733a | 7028 | 302c | 3830 | 2900 | 5f5f | 3074 | 6869 | 733a | 7228 | 302c | 3830 | 2900 | 5f5f | 3074 | 6869 | 7320 | 3a5a | 746c | 0067 |
| 4167700 | 6574 | 5f4d | 656d | 5f74 | 6563 | 684e | 756d | 5f5f | 3131 | 4d47 | 5f53 | 7065 | 6369 | 6669 | 6346 | 7620 | 3a5a | 7446 | 005f | 5f73 | 7469 | 5f5f | 4d47 | 5f53 |
| 4167760 | 7065 | 6369 | 6669 | 635f | 6378 | 785f | 7365 | 745f | 7465 | 6368 | 6e6f | 6c6f | 6779 | 5f6e | 616d | 655f | 3a46 | 2830 | 2c32 | 2900 | 2f75 | 7372 | 2f43 | 432f |
| 4170040 | 7375 | 6e34 | 2f69 | 6e63 | 6c2f | 696f | 7374 | 7265 | 616d | 2e68 | 005f | 5f73 | 7464 | 5f5f | 4d47 | 5f53 | 7065 | 6369 | 6669 | 635f | 6378 | 785f | 7365 | 745f |
| 4170120 | 7465 | 6368 | 6e6f | 6c6f | 6779 | 5f6e | 616d | 655f | 3a46 | 2830 | 2c32 | 2900 | 4d6f | 6447 | 656e | 2e6f | 005f | 436f | 6d70 | 6f73 | 655f | 4d6f | 6447 | 656e |
| 4170200 | 5f44 | 6573 | 6372 | 6970 | 746f | 725f | 5f36 | 4d6f | 6447 | 656e | 4650 | 6300 | 5f70 | 7574 | 5f5f | 376f | 7374 | 7265 | 616d | 4663 | 005f | 4c6f | 6164 | 5f56 |
| 4170260 | 4844 | 4c5f | 4461 | 7461 | 5f5f | 364d | 6f64 | 4765 | 6e46 | 5037 | 4e4f | 626a | 6563 | 7400 | 5f73 | 6574 | 496e | 6465 | 785f | 5f36 | 4d6f | 6447 | 656e | 4676 |
| 4170340 | 005f | 5f5f | 6374 | 5f5f | 3950 | 696e | 4c65 | 6e67 | 7469 | 4650 | 6354 | 3100 | 5f69 | 6f73 | 7472 | 6561 | 6d5f | 696e | 6974 | 005f | 6578 | 706c | 6169 | 6e5f |
| 4170420 | 5f38 | 4c50 | 4f62 | 6a65 | 6374 | 4650 | 6300 | 5f73 | 6574 | 4e61 | 6d65 | 496e | 6465 | 785f | 5f36 | 4d6f | 6447 | 656e | 4650 | 6300 | 5f69 | 6e4f | 7264 | 6572 |
| 4170500 | 5f5f | 364f | 626a | 6563 | 7446 | 5036 | 4f62 | 6a65 | 6374 | 002f | 686f | 6d65 | 2f6f | 7361 | 7331 | 2f61 | 2f61 | 622f | 7372 | 632f | 6e65 | 776f | 626a | 6563 |
| 4170560 | 7473 | 2f70 | 726f | 672f | 4d47 | 2f43 | 2b2b | 2e32 | 3237 | 3232 | 2f00 | 4d6f | 6447 | 656e | 2e63 | 004d | 6f64 | 4765 | 6e2e | 6378 | 7800 | 696e | 743a | 7428 |
| 4170640 | 302c | 3129 | 3d72 | 2830 | 2c31 | 293b | 2d32 | 3134 | 3734 | 3833 | 3634 | 383b | 3231 | 3437 | 3438 | 3336 | 3437 | 3b00 | 6368 | 6172 | 3a74 | 2830 | 2c32 | 293d |
| 4170720 | 7228 | 302c | 3229 | 3b30 | 3b31 | 3237 | 3b00 | 6c6f | 6e67 | 3a74 | 2830 | 2c33 | 293d | 7228 | 302c | 3129 | 3b2d | 3231 | 3437 | 3438 | 3336 | 3438 | 3b32 | 3134 |
| 4171000 | 3734 | 3833 | 3634 | 373b | 0073 | 686f | 7274 | 3a74 | 2830 | 2c34 | 293d | 7228 | 302c | 3129 | 3b2d | 3332 | 3736 | 383b | 3332 | 3736 | 373b | 0075 | 6e73 | 6967 |
| 4171060 | 6e65 | 6420 | 6368 | 6172 | 3a74 | 2830 | 2c35 | 293d | 7228 | 302c | 3129 | 3b30 | 3b32 | 3535 | 3b00 | 756e | 7369 | 676e | 6564 | 2073 | 686f | 7274 | 3a74 | 2830 |
| 4171140 | 2c36 | 293d | 7228 | 302c | 3129 | 3b30 | 3b36 | 3535 | 3335 | 3b00 | 756e | 7369 | 676e | 6564 | 206c | 6f6e | 673a | 7428 | 302c | 3729 | 3d72 | 2830 | 2c31 | 293b |
| 4171220 | 303b | 2d31 | 3b00 | 756e | 7369 | 676e | 6564 | 2069 | 6e74 | 3a74 | 2830 | 2c38 | 293d | 7228 | 302c | 3129 | 3b30 | 3b2d | 313b | 0066 | 6c6f | 6174 | 3a74 | 2830 |
| 4171300 | 2c39 | 293d | 7228 | 302c | 3129 | 3b34 | 3b30 | 3b00 | 646f | 7562 | 6c65 | 3a74 | 2830 | 2c31 | 3029 | 3d72 | 2830 | 2c31 | 293b | 383b | 303b | 0076 | 6f69 | 643a |
| 4171360 | 7428 | 302c | 3131 | 293d | 2830 | 2c31 | 3129 | 003f | 3f3f | 3a74 | 2830 | 2c31 | 3229 | 3d28 | 302c | 3129 | 005f | 5f76 | 7074 | 703a | 7428 | 302c | 3133 | 293d |
| 4171440 | 2a28 | 302c | 3134 | 293d | 6628 | 302c | 3129 | 005f | 5f6d | 7074 | 723a | 5428 | 302c | 3135 | 293d | 7338 | 643a | 2830 | 2c34 | 292c | 302c | 3136 | 3b69 | 3a28 |
| 4171520 | 302c | 3429 | 2c31 | 362c | 3136 | 3b66 | 3a28 | 302c | 3133 | 292c | 3332 | 2c33 | 323b | 3b00 | 5f50 | 4656 | 5f3a | 7428 | 302c | 3136 | 293d | 2a28 | 302c | 3137 |
| 4171600 | 293d | 6628 | 302c | 3229 | 005f | 5046 | 495f | 3a74 | 2830 | 2c31 | 3329 | 0065 | 7272 | 6e6f | 3a47 | 2830 | 2c31 | 2900 | 7379 | 735f | 6e65 | 7272 | 3a47 | 2830 |
| 4171660 | 2c31 | 2900 | 656e | 7669 | 726f | 6e3a | 4728 | 302c | 3139 | 293d | 2a28 | 302c | 3230 | 293d | 2a28 | 302c | 3229 | 0065 | 6e64 | 3a47 | 2830 | 2c31 | 2900 | 6574 |
| 4171740 | 6578 | 743a | 4728 | 302c | 3129 | 0065 | 6461 | 7461 | 3a47 | 2830 | 2c31 | 2900 | 6f70 | 7461 | 7267 | 3a47 | 2830 | 2c32 | 3029 | 006f | 7074 | 696e | 643a | 4728 |
| 4172020 | 302c | 3129 | 006f | 7074 | 6572 | 723a | 4728 | 302c | 3129 | 0070 | 7472 | 6469 | 6666 | 5f74 | 3a74 | 2830 | 2c31 | 2900 | 7369 | 7a65 | 5f74 | 3a74 | 2830 | 2c38 |
| 4172100 | 2900 | 7374 | 7265 | 616d | 706f | 733a | 7428 | 302c | 3129 | 0073 | 7472 | 6561 | 6d6f | 6666 | 3a74 | 2830 | 2c31 | 2900 | 696f | 5f73 | 7461 | 7465 | 3a54 | 2830 |
| 4172160 | 2c32 | 3129 | 3d65 | 676f | 6f64 | 6269 | 745f | 5f69 | 6f5f | 7374 | 6174 | 653a | 302c | 656f | 6662 | 6974 | 5f5f | 696f | 5f73 | 7461 | 7465 | 3a31 | 2c66 | 6169 |
| 4172240 | 6c62 | 6974 | 5f5f | 696f | 5f73 | 7461 | 7465 | 3a32 | 2c62 | 6164 | 6269 | 745f | 5f69 | 6f5f | 7374 | 6174 | 653a | 332c | 6861 | 7264 | 6661 | 696c | 5f5f | 696f |
| 4172320 | 5f73 | 7461 | 7465 | 3a34 | 2c3b | 006f | 7065 | 6e5f | 6d6f | 6465 | 3a54 | 2830 | 2c32 | 3229 | 3d65 | 696e | 5f5f | 6f70 | 656e | 5f6d | 6f64 | 653a | 302c | 6f75 |
| 4172400 | 745f | 5f6f | 7065 | 6e5f | 6d6f | 6465 | 3a31 | 2c61 | 7465 | 5f5f | 6f70 | 656e | 5f6d | 6f64 | 653a | 322c | 6170 | 705f | 5f6f | 7065 | 6e5f | 6d6f | 6465 | 3a33 |
| 4172460 | 2c74 | 7275 | 6e63 | 5f5f | 6f70 | 656e | 5f6d | 6f64 | 653a | 342c | 6e6f | 6372 | 6561 | 7465 | 5f5f | 6f70 | 656e | 5f6d | 6f64 | 653a | 352c | 6e6f | 7265 | 706c |

```
4172540 6163 655f 5f6f 7065 6e5f 6d6f 6465 3a36 2c3b 0073 6565 6b5f 6469 723a 5428 302c 3233 293d 6562 6567 5f5f 7365 656b 5f64
4172620 6972 3a30 2c63 7572 5f5f 7365 656b 5f64 6972 3a31 2c65 6e64 5f5f 7365 656b 5f64 6972 3a32 2c3b 005f 5f45 313a 5428 302c
4172700 3234 293d 6573 6b69 7077 735f 5f5f 5f45 313a 302c 6c65 6674 5f5f 5f5f 4531 3a31 2c72 6967 6874 5f5f 5f5f 4531 3a32 2c69
4172760 6e74 6572 6e61 6c5f 5f5f 5f45 313a 332c 6465 635f 5f5f 5f45 313a 342c 6f63 745f 5f5f 5f45 313a 352c 6865 785f 5f5f 5f45
4173040 313a 362c 7368 6f77 6261 7365 5f5f 5f5f 4531 3a37 2c5c 0073 686f 7770 6f69 6e74 5f5f 5f5f 4531 3a38 2c75 7070 6572 6361
4173120 7365 5f5f 5f5f 4531 3a39 2c73 686f 7770 6f73 5f5f 5f5f 4531 3a31 302c 7363 6965 6e74 6966 6963 5f5f 5f5f 4531 3a31 312c
4173200 6669 7865 645f 5f5f 5f45 313a 3132 2c75 6e69 7462 7566 5f5f 5f5f 4531 3a31 332c 7374 6469 6f5f 5f5f 5f45 313a 3134 2c3b
4173260 005f 5f45 323a 5428 302c 3235 293d 6573 6b69 7070 696e 675f 5f5f 5f45 323a 302c 7469 6564 5f5f 5f5f 4532 3a31 2c3b 0069
4173340 6f73 3a54 2830 2c32 3629 3d73 3630 6e75 7365 725f 5f33 696f 733a 2830 2c31 292c 302c 3332 3b78 5f75 7365 725f 5f33 696f
4173420 733a 2830 2c33 3029 3d2a 2830 2c32 3729 3d78 7569 6f73 5f75 7365 725f 756e 696f 6e3a 2c33 322c 3332 3b62 705f 5f33 696f
4173500 733a 2830 2c33 3129 3d2a 2830 2c32 3829 3d78 7373 7472 6561 6d62 7566 3a2c 3634 2c33 323b 7374 6174 655f 5f33 696f 733a
4173560 2830 2c31 292c 3936 2c33 323b 6973 7065 6369 616c 5f5f 3369 6f73 3a28 302c 3129 2c31 3238 2c33 323b 6f73 7065 6369 616c
4173640 5f5f 3369 6f73 3a28 302c 3129 2c31 3630 2c33 323b 6973 6678 5f73 7065 6369 616c 5f5f 3369 6f73 3a28 302c 3129 2c31 3932
4173720 2c33 323b 6f73 6678 5f73 7065 6369 616c 5f5f 3369 6f73 3a28 302c 3129 2c32 3234 2c33 323b 5c00 6465 6c62 7566 5f5f 3369
4174000 6f73 3a28 302c 3129 2c32 3536 2c33 323b 785f 7469 655f 5f33 696f 733a 2830 2c33 3229 3d2a 2830 2c32 3929 3d78 736f 7374
4174060 7265 616d 3a2c 3238 382c 3332 3b78 5f66 6c61 6773 5f5f 3369 6f73 3a28 302c 3129 2c33 3230 2c33 323b 785f 7072 6563 6973
4174140 696f 6e5f 5f33 696f 733a 2830 2c34 292c 3335 322c 3136 3b78 5f66 696c 6c5f 5f33 696f 733a 2830 2c32 292c 3336 382c 383b
4174220 785f 7769 6474 685f 5f33 696f 733a 2830 2c34 292c 3338 342c 3136 3b61 7373 6967 6e5f 7072 6976 6174 655f 5f33 696f 733a
4174300 2830 2c31 292c 3431 362c 3332 3b5f 5f76 7074 725f 5f33 696f 733a 2830 2c33 3329 3d2a 2830 2c31 3529 2c34 3438 2c33 323b
4174360 3b00 6261 7365 6669 656c 645f 5f33 696f 733a 4728 302c 3129 0061 646a 7573 7466 6965 6c64 5f5f 3369 6f73 3a47 2830 2c31
4174440 2900 666c 6f61 7466 6965 6c64 5f5f 3369 6f73 3a47 2830 2c31 2900 6e65 7874 6269 745f 5f33 696f 733a 4728 302c 3129 006e
4174520 6578 7477 6f72 645f 5f33 696f 733a 4728 302c 3129 0073 7464 696f 666c 7573 685f 5f33 696f 733a 4728 302c 3136 2900 696f
4174600 733a 5a63 696f 733b 3b5f 5f63 745f 5f33 696f 7346 5039 7374 7265 616d 6275 6620 5f5f 6374 5f5f 3369 6f73 4676 205f 5f63
4174660 745f 5f33 696f 7346 5233 696f 7320 5f5f 6474 5f5f 3369 6f73 4676 2066 6c61 6773 5f5f 3369 6f73 4676 2066 6c61 6773 5f5f
4174740 3369 6f73 466c 2073 6574 665f 5f33 696f 7346 6c54 3120 7365 7466 5f5f 3369 6f73 466c 2075 6e73 6574 665f 5f33 696f 7346
4175020 6c20 7769 6474 685f 5f33 696f 7346 7620 7769 6474 685f 5f33 696f 7346 6920 7469 655f 5f33 696f 7346 5037 6f73 7472 6561
4175100 6d20 5c00 7469 655f 5f33 696f 7346 7620 6669 6c6c 5f5f 3369 6f73 4663 2066 696c 6c5f 5f33 696f 7346 7620 7072 6563 6973
4175160 696f 6e5f 5f33 696f 7346 6920 7072 6563 6973 696f 6e5f 5f33 696f 7346 7620 7264 7374 6174 655f 5f33 696f 7346 7620 5f5f
4175240 6f70 5076 5f5f 3369 6f73 4676 205f 5f6e 745f 5f33 696f 7346 7620 656f 665f 5f33 696f 7346 7620 6661 696c 5f5f 3369 6f73
4175320 4676 2062 6164 5f5f 3369 6f73 4676 2067 6f6f 645f 5f33 696f 7346 7620 636c 6561 725f 5f33 696f 7346 6920 7264 6275 665f
4175400 5f33 696f 7346 7620 5c00 6977 6f72 645f 5f33 696f 7346 6920 7077 6f72 645f 5f33 696f 7346 6920 6269 7461 6c6c 6f63 5f5f
4175460 3369 6f73 5346 7620 7861 6c6c 6f63 5f5f 3369 6f73 5346 7620 7572 6573 697a 655f 5f33 696f 7346 6920 7379 6e63 5f77 6974
4175540 685f 7374 6469 6f5f 5f33 696f 7353 4676 2073 6574 7374 6174 655f 5f33 696f 7346 6920 696e 6974 5f5f 3369 6f73 4650 3973
4175620 7472 6561 6d62 7566 205f 5f61 735f 5f33 696f 7346 5233 696f 7320 736b 6970 5f5f 3369 6f73 4669 203b 6261 7365 6669 656c
4175700 645f 5f33 696f 7320 5c00 6164 6a75 7374 6669 656c 645f 5f33 696f 7320 666c 6f61 7466 6965 6c64 5f5f 3369 6f73 206e 6578
4175760 7462 6974 5f5f 3369 6f73 206e 6578 7477 6f72 645f 5f33 696f 7320 7374 6469 6f66 6c75 7368 5f5f 3369 6f73 203b 3b00 7374
4176040 7265 616d 6275 663a 5428 302c 3238 293d 7334 3061 6c6c 6f63 5f5f 3973 7472 6561 6d62 7566 3a28 302c 3429 2c30 2c31 363b
4176120 785f 756e 6275 665f 5f39 7374 7265 616d 6275 663a 2830 2c34 292c 3136 2c31 363b 785f 6261 7365 5f5f 3973 7472 6561 6d62
4176200 7566 3a29 302c 3230 292c 3332 2c33 323b 785f 7062 6173 655f 5f39 7374 7265 616d 6275 663a 2830 2c32 3029 2c36 342c 3332
4176260 3b78 5f70 7074 725f 5f39 7374 7265 616d 6275 663a 2830 2c32 3029 2c39 362c 3332 3b78 5f65 7070 7472 5f5f 3973 7472 6561
4176340 6d62 7566 3a28 302c 3230 292c 3132 382c 3332 3b78 5f67 7074 725f 5f39 7374 7265 616d 6275 663a 2830 2c32 3029 2c31 3630
4176420 2c33 323b 785f 6567 7074 725f 5f39 7374 7265 616d 6275 663a 2830 2c32 3029 2c31 3932 2c33 323b 5c00 785f 6562 6163 6b5f
4176500 5f39 7374 7265 616d 6275 663a 2830 2c32 3029 2c32 3234 2c33 323b 785f 626c 656e 5f5f 3973 7472 6561 6d62 7566 3a28 302c
4176560 3129 2c32 3536 2c33 323b 5f5f 7670 7472 5f5f 3973 7472 6561 6d62 7566 3a28 302c 3333 292c 3238 382c 3332 3b3b 0073 7472
4176640 6561 6d62 7566 3a5a 6373 7472 6561 6d62 7566 3b3b 5f5f 6374 5f5f 3973 7472 6561 6d62 7566 4652 3973 7472 6561 6d62 7566
4176720 205f 5f63 745f 5f39 7374 7265 616d 6275 6646 7620 5f5f 6374 5f5f 3973 7472 6561 6d62 7566 4650 6369 205f 5f63 745f 5f39
4177000 7374 7265 616d 6275 6646 5063 6954 322c 5f5f 6173 5f5f 3973 7472 6561 6d62 7566 4652 3973 7472 6561 6d62 7566 2064 6270
4177060 5f5f 3973 7472 6561 6d62 7566 4676 2062 6173 655f 5f39 7374 7265 616d 6275 6646 7620 7062 6173 655f 5f39 7374 7265 616d
4177140 6275 6646 7620 5c00 7070 7472 5f5f 3973 7472 6561 6d62 7566 4676 2065 7070 7472 5f5f 3973 7472 6561 6d62 7566 4676 2067
4177220 7074 725f 5f39 7374 7265 616d 6275 6646 7620 6567 7074 725f 5f39 7374 7265 616d 6275 6646 7620 6562 6163 6b5f 5f39 7374
4177300 7265 616d 6275 6646 7620 6562 7566 5f5f 3973 7472 6561 6d62 7566 4676 2062 6c65 6e5f 5f39 7374 7265 616d 6275 6646 7620
4177360 7365 7470 5f5f 3973 7472 6561 6d62 7566 4650 6354 3120 7365 7467 5f5f 3973 7472 6561 6d62 7566 4650 634e 3231 2070 6275
4177440 6d70 5f5f 3973 7472 6561 6d62 7566 4669 205c 0067 6275 6d70 5f5f 3973 7472 6561 6d62 7566 4669 2073 6574 625f 5f39 7374
4177520 7265 616d 6275 6646 5063 5431 6920 756e 6275 6666 6572 6564 5f5f 3973 7472 6561 6d62 7566 4676 2075 6e62 7566 6665 7265
4177600 645f 5f39 7374 7265 616d 6275 6646 6920 616c 6c6f 6361 7465 5f5f 3973 7472 6561 6d62 7566 4676 2064 6f61 6c6c 6f63 6174
```

4177660 655f 5f37 7374 7265 616d 6275 6646 7620 5f76 6572 666c 6f77 5f5f 3973 7472 6561 6d62 7566 4669 2075 6e64 6572 666c 6f77
4177740 5f5f 3973 7472 6561 6d62 7566 4676 205c 0070 6261 636b 6661 696c 5f5f 3973 7472 6561 6d62 7566 4669 2073 796e 635f 5f39
4200020 7374 7265 616d 6275 6646 7620 7365 656b 6f66 665f 5f39 7374 7265 616d 6275 6646 6c38 7365 656b 5f64 6972 6920 7365 656b
4200100 706f 735f 5f39 7374 7265 616d 6275 6646 6c69 2078 7370 7574 6e5f 5f39 7374 7265 616d 6275 6646 5043 6369 2078 7367 6574
4200160 6e5f 5f39 7374 7265 616d 6275 6646 5063 6920 696e 5f61 7661 696c 5f5f 3973 7472 6561 6d62 7566 4676 206f 7574 5f77 6169
4200240 7469 6e67 5f5f 3973 7472 6561 6d62 7566 4676 205c 0073 6765 7463 5f5f 3973 7472 6561 6d62 7566 4676 2073 6e65 7874 635f
4200320 5f39 7374 7265 616d 6275 6646 7520 7362 756d 7063 5f5f 3973 7472 6561 6d62 7566 4676 2073 746f 7373 635f 5f39 7374 7265
4200400 616d 6275 6646 7620 7370 7574 6261 636b 635f 5f39 7374 7265 616d 6275 6646 6320 7370 7574 635f 5f39 7374 7265 616d 6275
4200460 6646 6920 7370 7574 6e5f 5f39 7374 7265 616d 6275 6646 5043 6369 2073 6765 746e 5f5f 3973 7472 6561 6d62 7566 4650 6369
4200540 2073 6574 6275 665f 5f39 7374 7265 616d 6275 6646 5063 6920 5c00 7365 7462 7566 5f5f 3973 7472 6561 6d62 7566 4650 5563
4200620 6920 7365 7462 7566 5f5f 3973 7472 6561 6d62 7566 4650 6369 5432 205f 5f64 745f 5f39 7374 7265 616d 6275 6646 7620 785f
4200700 736e 6578 7463 5f5f 3973 7472 6561 6d62 7566 4676 203b 3b3b 0069 7374 7265 616d 3a54 2830 2c33 3429 3d73 3732 785f 6763
4200760 6f75 6e74 5f5f 3769 7374 7265 616d 3a28 302c 3129 2c30 2c33 323b 5f5f 7670 7472 5f5f 3769 7374 7265 616d 3a28 302c 3333
4201040 292c 3332 2c33 323b 5069 6f73 3a28 302c 3335 293d 2a28 302c 3236 292c 3634 2c33 323b 4f69 6f73 3a28 302c 3236 292c 3936
4201120 2c34 3830 3b3b 0069 7374 7265 616d 3a5a 6369 7374 7265 616d 3b69 6f73 3b5f 5f63 745f 5f37 6973 7472 6561 6d46 5039 7374
4201200 7265 616d 6275 6620 5f5f 6374 5f5f 3769 7374 7265 616d 4676 205f 5f63 745f 5f37 6973 7472 6561 6d46 5039 7374 7265 616d
4201260 6275 6669 5037 6f73 7472 6561 6d20 5f5f 6374 5f5f 3769 7374 7265 6163 4669 5063 5431 205f 5f63 745f 5f37 6973 7472 6561
4201340 6d46 6954 3150 376f 7374 7265 616d 205f 5f63 745f 5f37 6973 7472 6561 6d46 5237 6973 7472 6561 6d20 5f5f 6474 5f5f 3769
4201420 7374 7265 616d 4676 205c 0069 7066 785f 5f37 6973 7472 6561 6d46 6920 6973 6678 5f5f 3769 7374 7265 616d 4676 2073 6565
4201500 6b67 5f5f 3769 7374 7265 616d 456c 2073 6565 6b67 5f5f 3769 7374 7265 616d 466c 3873 6565 6b5f 6469 7220 7465 6c6c 675f
4201560 5f37 6973 7472 6561 6d46 7620 5f5f 7273 5f5f 3769 7374 7265 616d 4650 4652 3769 7374 7265 616d 5f52 3769 7374 7265 616d
4201640 205f 5f72 735f 5f37 6973 7472 6561 6d46 5046 5233 696f 735f 5233 696f 7320 5f5f 7273 5f5f 3769 7374 7265 616d 4650 6320
4201720 5f5f 7273 5f5f 3769 7374 7265 616d 4650 5563 205c 005f 5f72 735f 5f37 6973 7472 6561 6d46 5255 6320 5f5f 7273 5f5f 3769
4202000 7374 7265 616d 4652 6320 5f5f 7273 5f5f 3769 7374 7265 616d 4652 7320 5f5f 7273 5f5f 3769 7374 7265 616d 4652 6920 5f5f
4202060 7273 5f5f 3769 7374 7265 616d 4652 6c20 5f5f 7273 5f5f 3769 7374 7265 616d 4652 5573 205f 5f72 735f 5f37 6973 7472 6561
4202140 6d46 5255 6920 5f5f 7273 5f5f 3769 7374 7265 616d 4652 556c 205f 5f72 735f 5f37 6973 7472 6561 6d46 5266 205f 5f72 735f
4202220 5f37 6973 7472 6561 6d46 5264 205f 5f72 735f 5f37 6973 7472 6561 6d46 5039 7374 7265 616d 6275 6620 5c00 6765 745f 5f37
4202300 6973 7472 6561 6d46 5063 6963 2067 6574 5f5f 3769 7374 7265 616d 4650 5563 6963 2067 6574 5f5f 3769 7374 7265 616d 4652
4202360 3973 7472 6561 6162 7566 6320 6765 745f 5f37 6973 7472 6561 6d46 5255 6320 6765 745f 5f37 6973 7472 6561 6d46 5263 2067
4202440 6574 5f5f 3769 7374 7265 616d 4676 2067 6574 6c69 6e65 5f5f 3769 7374 7265 616d 4650 6369 6320 6765 746c 696e 655f 5f37
4202520 6973 7472 6561 6d46 5055 6369 6320 7065 656b 5f5f 3769 7374 7265 616d 4676 2069 676e 6f72 655f 5f37 6973 7472 6561 6d46
4202600 6954 3120 5c00 7265 6164 5f5f 3769 7374 7265 616d 4650 6369 2072 6561 645f 5f37 6973 7472 6561 6d46 5055 6369 2067 636f
4202660 756e 745f 5f37 6973 7472 6561 6d46 7620 7075 7462 6163 6b5f 5f37 6973 7472 6561 6d46 6320 7379 6e63 5f5f 3769 7374 7265
4202740 616d 4676 2064 6f5f 6970 6678 5f5f 3769 7374 7265 616d 4669 2065 6174 7768 6974 655f 5f37 6973 7472 6561 6d46 7620 7867
4203020 6574 5f5f 3769 7374 7265 616d 4650 6320 3b3b 3b00 6f73 7472 6561 6d3a 5428 302c 3239 293d 7336 385f 5f76 7074 725f 5f37
4203100 6f73 7472 6561 613a 2830 2c33 3329 2c30 2c33 323b 5069 6f73 3a28 302c 3335 292c 3332 2c33 323b 4f69 6f73 3a28 302c 3236
4203160 292c 3634 2c34 3830 3b3b 006f 7374 7265 616d 3a5a 636f 7374 7265 616d 3b69 6f73 3b5f 5f63 745f 5f37 6f73 7472 6561 6d46
4203240 5039 7374 7265 616d 6275 6620 5f5f 6374 5f5f 376f 7374 7265 616d 4676 205f 5f63 745f 5f37 6f73 7472 6561 6d46 6920 5f5f
4203320 6374 5f5f 376f 7374 7265 6163 4669 5063 205f 5f63 745f 5f37 6f73 7472 6561 6d46 5237 6f73 7472 6561 6d20 5f5f 6474 5f5f
4203400 376f 7374 7265 616d 4676 206f 7066 785f 5f37 6f73 7472 6561 6d46 7620 6f73 6678 5f5f 376f 7374 7265 616d 4676 2066 6c75
4203460 7368 5f5f 376f 7374 7265 6164 4676 205c 0073 6565 6b70 5f5f 376f 7374 7265 616d 466c 2073 6565 6b70 5f5f 376f 7374 7265
4203540 616d 466c 3873 6565 6b5f 6469 7220 7465 6c6c 705f 5f37 6f73 7472 6561 6d46 7620 7075 745f 5f37 6f73 7472 6561 6d46 6320
4203620 5f5f 6c73 5f5f 376f 7374 7265 616d 4663 205f 5f6c 735f 5f37 6f73 7472 6561 6d46 5563 205f 5f6c 735f 5f37 6f73 7472 6561
4203700 6d46 5043 6320 5f5f 6c73 5f5f 376f 7374 7265 616d 4669 205f 5f6c 735f 5f37 6f73 7472 6561 6d46 6c20 5f5f 6c73 5f5f 376f
4203760 7374 7265 616d 4664 205f 5f6c 735f 5f37 6f73 7472 6561 6d46 6920 5c00 5f5f 6c73 5f5f 376f 7374 7265 616d 4655 6920 5f5f
4204040 6c73 5f5f 376f 7374 7265 616d 4655 6c20 5f5f 6c73 5f5f 376f 7374 7265 616d 4650 7620 5f5f 6c73 5f5f 376f 7374 7265 616d
4204120 4650 3973 7472 6561 6d62 7566 205f 5f6c 735f 5f37 6f73 7472 6561 6d46 7320 5f5f 6c73 5f5f 376f 7374 7265 616d 4655 7320
4204200 5f5f 6c73 5f5f 376f 7374 7265 616d 4650 4652 376f 7374 7265 616d 5f52 376f 7374 7265 616d 205f 5f6c 735f 5f37 6f73 7472
4204260 6561 6d46 5046 5233 696f 735f 5233 696f 7320 7772 6974 655f 5f37 6f73 7472 6561 6d46 5043 6369 205c 0077 7269 7465 5f5f
4204340 376f 7374 7265 616d 4650 4355 6369 2064 6f5f 6f70 6678 5f5f 376f 7374 7265 616d 4676 2064 6f5f 6f73 6678 5f5f 376f 7374
4204420 7265 616d 4676 203b 3b3b 0070 7574 5f5f 376f 7374 7265 616d 4663 3a66 2830 2c33 3629 3d2a 2830 2c32 3929 005f 5f30 7468
4204500 6973 3a70 2830 2c33 3629 005f 5f30 633a 7028 302c 3229 002f 7573 722f 4343 2f73 756e 342f 696e 636c 2f69 6f73 7472 6561
4204560 6d2e 6800 5f5f 3074 6869 733a 7228 302c 3336 2900 5f5f 3074 6869 7320 3a5a 746c 005f 5f30 6320 3a5a 746c 0070 7574 5f5f
4204640 376f 7374 7265 616d 4663 203a 5a74 4690 696f 7374 7265 616d 3a54 2830 2c33 3729 3d73 3830 785f 6763 6f75 6e74 5f5f 3769
4204720 7374 7265 616d 3a28 302c 3129 2c30 2c33 323b 5f5f 7670 7472 5f5f 3769 7374 7265 616d 3a28 302c 3333 292c 3332 2c33 323b 4205000 5069 6f73 3a28 302c 3335 292c 3b34 2c33 323b 4f6f 7374 7265 616d 3a28 302c 3239 292c 3936 2c35 3434 3b3b 3069 6f73 7472
4205060 6561 6d3a 5a63 696f 7374 7265 616d 3b69 7374 7265 616d 206f 7374 7265 616d 2069 6f73 3b5f 5f63 745f 5f38 696f 7374 7265
4205140 616d 4650 3973 7472 6561 6d62 7566 205f 5f63 745f 5f38 696f 7374 7265 616d 4676 205f 5f63 745f 5f38 696f 7374 7265 616d
4205220 4652 3869 6f73 7472 6561 6d20 5f5f 6474 5f5f 3869 6f73 7472 6561 6d46 7620 3b3b 3b00 6369 6e3a 4728 302c 3338 293d 7873
4205300 6973 7472 6561 615f 7769 7468 6173 7369 676e 3a00 636f 7574 3a47 2830 2c33 3929 3d78 736f 7374 7265 616d 5f77 6974 6861
4205360 7373 6967 6e3a 0063 6572 723a 4728 302c 3339 2900 636c 6f67 3a47 2830 2c33 3929 0049 6f73 7472 6561 6d5f 696e 6974 3a54
4205440 2830 2c34 3029 3173 315f 5f57 395f 5f31 3349 6f73 7472 6561 6d5f 696e 6974 3a28 302c 3229 2c30 2c38 3b3b 0073 7464 7374
4205520 6174 7573 5f5f 3133 496f 7374 7265 616d 5f69 6e69 743a 4728 302c 3129 0069 6e69 7463 6f75 6e74 5f5f 3133 496f 7374 7265
4205600 616d 5f69 6e69 743a 4728 302c 3129 0049 6f73 7472 6561 6d5f 696e 6974 3a5a 6349 6f73 7472 6561 615f 696e 6974 3b3b 5f5f
4205660 6374 5f5f 3133 496f 7374 7265 616d 5f69 6e69 7446 7620 5f5f 6474 5f5f 3133 496f 7374 7265 616d 5f69 6e69 7446 7620 3b73
4205740 7464 7374 6174 7573 5f5f 3133 496f 7374 7265 616d 5f69 6e69 7420 696e 6974 636f 756e 745f 5f31 3349 6f73 7472 6561 6d5f
4206020 696e 6974 203b 4069 6f73 3b00 696f 7374 7265 616d 5f69 6e69 743a 5328 302c 3430 2900 4750 543a 7428 302c 3133 2900 736d
4206100 616e 6970 5f69 6e74 3a54 2830 2c34 3129 3d73 3866 6374 5f5f 3130 736d 616e 6970 5f69 6e74 3a28 302c 3432 293d 2a28 302c
4206160 3433 293d 6628 302c 3335 292c 302c 3332 3b61 7267 5f5f 3130 736d 616e 6970 5f69 6e74 3a28 302c 3129 2c33 322c 3332 3b3b
4206240 0073 6d61 6e69 705f 696e 743a 5a63 736d 616e 6970 5f69 6e74 3b3b 5f5f 6374 5f5f 3130 736d 616e 6970 5f69 6e74 4650 4652
4206320 3369 6f73 695f 5233 696f 7369 203b 3b5f 5f6c 735f 5f46 5237 6f73 7472 6561 6d52 3130 736d 616e 6970 5f69 6e74 205f 5f72
4206400 735f 5f46 5237 6973 7472 6561 6352 3130 736d 616e 6970 5f69 6e74 203b 0073 6170 706c 795f 696e 743a 5428 302c 3434 293d
4206460 7334 6663 745f 5f31 3073 6170 706c 795f 696e 743a 2830 2c34 3229 2c33 2c33 323b 3b00 7361 7070 6c79 5f69 6e74 3a5a 6373
4206540 6170 706c 795f 696e 743b 3b5f 5f63 745f 5f31 3073 6170 706c 795f 696e 7446 5046 5233 696f 7369 5f52 3369 6f73 205f 5f63
4206620 6c5f 5f31 3073 6170 706c 795f 696e 7446 6920 3b3b 3b00 696d 616e 6970 5f69 6e74 3a54 2830 2c34 3529 3d73 3866 6374 5f5f
4206700 3130 696d 616e 6970 5f69 6e74 3a28 302c 3436 293d 2a28 302c 3437 293d 6628 302c 3438 293d 2a28 302c 3334 292c 302c 3332
4206760 3b61 7267 5f5f 3130 696d 616e 6970 5f69 6e74 3a28 302c 3129 2c33 322c 3332 3b3b 0069 6d61 6e69 705f 696e 743a 5a63 696d
4207040 616e 6970 5f69 6e74 3b3b 5f5f 6374 5f5f 3130 696d 616e 6970 5f69 6e74 4650 4652 3769 7374 7265 616d 695f 5237 6973 7472
4207120 6561 6d69 203b 3b5f 5f72 735f 5f46 5237 6973 7472 6561 6d52 3130 696d 616e 6970 5f69 6e74 203b 0069 6170 706c 795f 696e
4207200 743a 5428 302c 3439 293d 7334 6663 745f 5f31 3069 6170 706c 795f 696e 743a 2830 2c34 3629 2c30 2c33 323b 3b00 6961 7070
4207260 6c79 5f69 6e74 3a5a 6369 6170 706c 795f 696e 743b 3b5f 5f63 745f 5f31 3069 6170 706c 795f 696e 7446 5046 5237 6973 7472
4207340 6561 6d69 5f52 3769 7374 7265 616d 205f 5f63 6c5f 5f31 3069 6170 706c 795f 696e 7446 6920 3b3b 3b00 6f6d 616e 6970 5f69
4207420 6e74 3a54 2830 2c35 3029 3d73 3866 6374 5f5f 3130 6f6d 616e 6970 5f69 6e74 3a28 302c 3531 293d 2a28 302c 3532 293d 6628
4207500 302c 3336 292c 302c 3332 3b61 7267 5f5f 3130 6f6d 616e 6970 5f69 6e74 3a28 302c 3129 2c33 322c 3332 3b3b 006f 6d61 6e69
4207560 705f 696e 743a 5a63 6f6d 616e 6970 5f69 6e74 3b3b 5f5f 6374 5f5f 3130 6f6d 616e 6970 5f69 6e74 4650 4652 376f 7374 7265
4207640 616d 695f 5237 6f73 7472 6561 6369 203b 3b5f 5f6c 735f 5f46 5237 6f73 7472 6561 6d52 3130 6f6d 616e 6970 5f69 6e74 203b
4207720 006f 6170 706c 795f 696e 743a 5428 302c 3533 293d 7334 6663 745f 5f31 306f 6170 706c 795f 696e 743a 2830 2c35 3129 2c30
4210000 2c33 323b 3b00 6f61 7070 6c79 5f69 6e74 3a5a 636f 6170 706c 795f 696e 743b 3b5f 5f63 745f 5f31 306f 6170 706c 795f 696e
4210060 7446 5046 5237 6f73 7472 6561 6d69 5f52 376f 7374 7265 616d 205f 5f63 6c5f 5f31 306f 6170 706c 795f 696e 7446 6920 3b3b
4210140 3b00 696f 6d61 6e69 705f 696e 743a 5428 302c 3534 293d 7338 6663 745f 5f31 3169 6f6d 616e 6970 5f69 6e74 3a28 302c 3535
4210220 293d 2a28 302c 3536 293d 6628 302c 3537 293d 2a28 302c 3337 292c 302c 3332 3b61 7267 5f5f 3131 696f 6d61 6e69 705f 696e
4210300 743a 2830 2c31 292c 3332 2c33 323b 3b00 696f 6d61 6e69 705f 696e 743a 5a63 696f 6d61 6e69 705f 696e 743b 3b5f 5f63 745f
4210360 5f31 3169 6f6d 616e 6970 5f69 6e74 4650 4652 3869 6f73 7472 6561 6d69 5f52 3869 6f73 7472 6561 6d69 203b 3b5f 5f6c 735f
4210440 5f46 5238 696f 7374 7265 616d 5231 3169 6f6d 616e 6970 5f69 6e74 205f 5f72 735f 5f46 5238 696f 7374 7265 616d 5231 3169
4210520 6f6d 616e 6970 5f69 6e74 203b 0069 6f61 7070 6c79 5f69 6e74 3a54 2830 2c35 3829 3d73 3466 6374 5f5f 3131 696f 6170 706c
4210600 795f 696e 743a 2830 2c35 3529 2c30 2c33 323b 3b00 696f 6170 706c 795f 696e 743a 5a63 696f 6170 706c 795f 696e 743b 3b5f
4210660 5f63 745f 5f31 3169 6f61 7070 6c79 5f69 6e74 4650 4652 3869 6f73 7472 6561 6d69 5f52 3869 6f73 7472 6561 6d20 5f5f 636c
4210740 5f5f 3131 696f 6170 706c 795f 696e 7446 6920 3b3b 3b00 736d 616e 6970 5f6c 6f6e 673a 5428 302c 3539 293d 7338 6663 745f
4211020 5f31 3173 6d61 6e69 705f 6c6f 6e67 3a28 302c 3432 292c 302c 3332 3b61 7267 5f5f 3131 736d 616e 6970 5f6c 6f6e 673a 2830
4211100 2c31 292c 3332 2c33 323b 3b00 736d 616e 6970 5f6c 6f6e 673a 5a63 736d 616e 6970 5f6c 6f6e 673b 3b5f 5f63 745f 5f31 3173
4211160 6d61 6e69 705f 6c6f 6e67 4650 4652 3369 6f73 6c5f 5233 696f 736c 203b 3b5f 5f6c 735f 5f46 5237 6f73 7472 6561 6d52 3131
4211240 736d 616e 6970 5f6c 6f6e 6720 5f5f 7273 5f5f 4652 3769 7374 7265 616d 5231 3173 6d61 6e69 705f 6c6f 6e67 203b 0073 6170
4211320 706c 795f 6c6f 6e67 3a54 2830 2c36 3029 3d73 3466 6374 5f5f 3131 7361 7070 6c79 5f6c 6f6e 673a 2830 2c34 3229 2c30 2c33
4211400 323b 3b00 7361 7070 6c79 5f6c 6f6e 673a 5a63 7361 7070 6c79 5f6c 6f6e 673b 3b5f 5f63 745f 5f31 3173 6170 706c 795f 6c6f
4211460 6e67 4650 4652 3369 6f73 6c5f 5233 696f 7320 5f5f 636c 5f5f 3131 7361 7070 6c79 5f6c 6f6e 6746 6c20 3b3b 3b00 696d 616e
4211540 6970 5f6c 6f6e 673a 5428 302c 3631 293d 7338 6663 745f 5f31 3169 6d61 6e69 705f 6c6f 6e67 3a28 302c 3436 292c 302c 3332
4211620 3b61 7267 5f5f 3131 696d 616e 6970 5f6c 6f6e 673a 2830 2c31 292c 3332 2c33 323b 3b00 696d 616e 6970 5f6c 6f6e 673a 5a63
4211700 696d 616e 6970 5f6c 6f6e 673b 3b5f 5f63 745f 5f31 3169 6d61 6e69 705f 6c6f 6e67 4650 4652 3769 7374 7265 616d 6c5f 5237
4211760 6973 7472 6561 616c 203b 3b5f 5f72 735f 5f46 5237 6973 7472 6561 6d52 3131 696d 616e 6970 5f6c 6f6e 6720 3b00 6961 7070
4212040 6c79 5f6c 6f6e 673a 5428 302c 3632 293d 7334 6663 745f 5f31 3169 6170 706c 795f 6c6f 6e67 3a28 302c 3436 292c 302c 3332

| | | | | | | | | | | | | | | | | | | | | | | | | |
|---|---|---|---|---|---|---|---|---|---|---|---|---|---|---|---|---|---|---|---|---|---|---|---|---|
| 4212120 | 3b3b | 0069 | 6170 | 706c | 795f | 6c6f | 6e67 | 3a5a | 6369 | 6170 | 706c | 795f | 6c6f | 6e67 | 3b3b | 5f5f | 6374 | 5f5f | 3131 | 6961 | 7070 | 6c79 | 5f6c | 6f6e |
| 4212200 | 6746 | 5046 | 5237 | 6373 | 7472 | 6561 | 616c | 5f52 | 3769 | 7374 | 7265 | 616d | 205f | 5f63 | 6c5f | 5f31 | 3169 | 6170 | 706c | 795f | 6c6f | 6e67 | 466c | 203b |
| 4212260 | 3b3b | 006f | 6d61 | 6e69 | 705f | 6c6f | 6e67 | 3a54 | 2830 | 2c36 | 3329 | 3d73 | 3866 | 6374 | 5f5f | 3131 | 6f6d | 616e | 6970 | 5f6c | 6f6e | 673a | 2830 | 2c35 |
| 4212340 | 3129 | 2c30 | 2c33 | 323b | 6172 | 675f | 5f31 | 316f | 6d61 | 6e69 | 705f | 6c6f | 6e67 | 3a28 | 302c | 3129 | 2c33 | 322c | 3332 | 3b3b | 006f | 6d61 | 6e69 | 705f |
| 4212420 | 6c6f | 6e67 | 3a5a | 636f | 6d61 | 6e69 | 705f | 6c6f | 6e67 | 3b3b | 5f5f | 6374 | 5f5f | 3131 | 6f6d | 616e | 6970 | 5f6c | 6f6e | 6746 | 5046 | 5237 | 6f73 | 7472 |
| 4212500 | 6561 | 6d6c | 5f52 | 376f | 7374 | 7265 | 616d | 6c20 | 3b3b | 5f5f | 6c73 | 5f5f | 4652 | 376f | 7374 | 7265 | 616d | 5231 | 316f | 6d61 | 6e69 | 705f | 6c6f | 6e67 |
| 4212560 | 203b | 006f | 6170 | 706c | 795f | 6c6f | 6e67 | 3a54 | 2830 | 2c36 | 3429 | 3473 | 3466 | 6374 | 5f5f | 3131 | 6f61 | 7070 | 6c79 | 5f6c | 6f6e | 673a | 2830 | 2c35 |
| 4212640 | 3129 | 2c30 | 2c33 | 323b | 3b00 | 6f61 | 7070 | 6c79 | 5f6c | 6f6e | 673a | 5a63 | 6f61 | 7070 | 6c79 | 5f6c | 6f6e | 673b | 3b5f | 5f63 | 745f | 5f31 | 316f | 6170 |
| 4212720 | 706c | 795f | 6c6f | 6e67 | 4650 | 4652 | 376f | 7374 | 7265 | 616d | 6c5f | 5237 | 6f73 | 7472 | 6561 | 6d20 | 5f5f | 636c | 5f5f | 3131 | 6f61 | 7070 | 6c79 | 5f6c |
| 4213000 | 6f6e | 6746 | 6c20 | 3b3b | 3b00 | 696f | 6d61 | 6e69 | 705f | 6c6f | 6e67 | 3a54 | 2830 | 2c36 | 3529 | 3d73 | 3866 | 6374 | 5f5f | 3132 | 696f | 6d61 | 6e69 | 705f |
| 4213060 | 6c6f | 6e67 | 3a28 | 302c | 3535 | 292c | 302c | 3332 | 3b61 | 7267 | 5f5f | 3132 | 696f | 6d61 | 6e69 | 705f | 6c6f | 6e67 | 3a28 | 302c | 3129 | 2c33 | 322c | 3332 |
| 4213140 | 3b3b | 0069 | 6f6d | 616e | 6970 | 5f6c | 6f6e | 673a | 5a63 | 696f | 6d61 | 6e69 | 705f | 6c6f | 6e67 | 3b3b | 5f5f | 6374 | 5f5f | 3132 | 696f | 6d61 | 6e69 | 705f |
| 4213220 | 6c6f | 6e67 | 4650 | 4652 | 3869 | 6f73 | 7472 | 6561 | 6d6c | 5f52 | 3869 | 6f73 | 7472 | 6561 | 6d6c | 203b | 3b5f | 5f6c | 735f | 5f46 | 5238 | 696f | 7374 | 7265 |
| 4213300 | 616d | 5231 | 3269 | 6f6d | 616e | 6970 | 5f6c | 6f6e | 6720 | 5f5f | 7273 | 5f5f | 4652 | 3869 | 6f73 | 7472 | 6561 | 6d52 | 3132 | 696f | 6d61 | 6e69 | 705f | 6c6f |
| 4213360 | 6e67 | 203b | 0069 | 6f61 | 7070 | 6c79 | 5f6c | 6f6e | 673a | 5428 | 302c | 3636 | 293d | 7334 | 6663 | 745f | 5f31 | 3269 | 6f61 | 7070 | 6c79 | 5f6c | 6f6e | 673a |
| 4213440 | 2830 | 2c35 | 3529 | 2c30 | 2c33 | 323b | 3b00 | 696f | 6170 | 706c | 795f | 6c6f | 6e67 | 3a5a | 6369 | 6f61 | 7070 | 6c79 | 5f6c | 6f6e | 673b | 3b5f | 5f63 | 745f |
| 4213520 | 5f31 | 3269 | 6f61 | 7070 | 6c79 | 5f6c | 6f6e | 6746 | 5046 | 5238 | 696f | 7374 | 7265 | 616d | 6c5f | 5238 | 696f | 7374 | 7265 | 616d | 205f | 5f63 | 6c5f | 5f31 |
| 4213600 | 3269 | 6f61 | 7070 | 6c79 | 5f6c | 6f6e | 6746 | 6c20 | 3b3b | 3b00 | 7374 | 6469 | 6f62 | 7566 | 3a54 | 2830 | 2c36 | 3729 | 3d73 | 3532 | 616c | 6c6f | 635f | 5f39 |
| 4213660 | 7374 | 7265 | 616d | 6275 | 663a | 2830 | 2c34 | 292c | 302c | 3136 | 3b78 | 5f75 | 6e62 | 7566 | 5f5f | 3973 | 7472 | 6561 | 6d62 | 7566 | 3a28 | 302c | 3429 | 2c31 |
| 4213740 | 362c | 3136 | 3b78 | 5f62 | 6173 | 655f | 5f39 | 7374 | 7265 | 616d | 6275 | 663a | 2830 | 2c32 | 3029 | 2c33 | 322c | 3332 | 3b78 | 5f70 | 6261 | 7365 | 5f5f | 3973 |
| 4214020 | 7472 | 6561 | 6d62 | 7566 | 3a28 | 302c | 3230 | 292c | 3634 | 2c33 | 323b | 785f | 7070 | 7472 | 5f5f | 3973 | 7472 | 6561 | 6d62 | 7566 | 3a28 | 302c | 3230 | 292c |
| 4214100 | 3936 | 2c33 | 323b | 785f | 6570 | 7074 | 725f | 5f39 | 7374 | 7265 | 616d | 6275 | 663a | 2830 | 2c32 | 3029 | 2c31 | 3238 | 2c33 | 323b | 785f | 6770 | 7472 | 5f5f |
| 4214160 | 3973 | 7472 | 6561 | 6d62 | 7566 | 3a28 | 302c | 3230 | 292c | 3136 | 302c | 3332 | 3b78 | 5f65 | 6770 | 7472 | 5f5f | 3973 | 7472 | 6561 | 6d62 | 7566 | 3a28 | 302c |
| 4214240 | 3230 | 292c | 3139 | 322c | 3332 | 3b5c | 0078 | 5f65 | 6261 | 636b | 5f5f | 3973 | 7472 | 6561 | 6d62 | 7566 | 3a28 | 302c | 3230 | 292c | 3232 | 342c | 3332 | 3b78 |
| 4214320 | 5f62 | 6c65 | 6e5f | 5f39 | 7374 | 7265 | 616d | 6275 | 663a | 2830 | 2c31 | 292c | 3235 | 362c | 3332 | 3b5f | 5f76 | 7074 | 725f | 5f39 | 7374 | 7265 | 616d | 6275 |
| 4214400 | 663a | 2830 | 2c33 | 3329 | 2c32 | 3838 | 2c33 | 323b | 6670 | 5f5f | 3873 | 7464 | 696f | 6275 | 663a | 2830 | 2c36 | 3829 | 3d2a | 2830 | 2c31 | 3829 | 3d78 | 735f |
| 4214460 | 696f | 6275 | 663a | 2c33 | 3230 | 2c33 | 323b | 6c61 | 7374 | 5f6f | 705f | 5f38 | 7374 | 6469 | 6f62 | 7566 | 3a28 | 302c | 3129 | 2c33 | 3532 | 2c33 | 323b | 6275 |
| 4214540 | 665f | 5f38 | 7374 | 6469 | 6f62 | 7566 | 3a28 | 302c | 3639 | 293d | 6172 | 2830 | 2c31 | 293b | 303b | 313b | 2830 | 2c32 | 292c | 3338 | 342c | 3136 | 3b3b | 0073 |
| 4214620 | 7464 | 696f | 6275 | 663a | 5a63 | 7374 | 6469 | 6f62 | 7566 | 3b73 | 7472 | 6561 | 6d62 | 7566 | 3b6f | 7665 | 7266 | 6c6f | 775f | 5f38 | 7374 | 6469 | 6f62 | 7566 |
| 4214700 | 4669 | 2075 | 6e64 | 6572 | 666c | 6f77 | 5f5f | 3873 | 7464 | 696f | 6275 | 6646 | 7620 | 7379 | 6e63 | 5f5f | 3873 | 7464 | 696f | 6275 | 6646 | 7620 | 7365 | 656b |
| 4214760 | 6f66 | 665f | 5f38 | 7374 | 6469 | 6f62 | 7566 | 466c | 3873 | 6565 | 6b5f | 6469 | 7269 | 2070 | 6261 | 636b | 6661 | 696c | 5f5f | 3873 | 7464 | 696f | 6275 | 6646 |
| 4215040 | 6920 | 5f5f | 6374 | 5f5f | 3873 | 7464 | 696f | 6275 | 6646 | 5036 | 5f69 | 6f62 | 7566 | 205f | 5f63 | 745f | 5f38 | 7374 | 6469 | 6f62 | 7566 | 4652 | 4338 | 7374 |
| 4215120 | 6469 | 6f62 | 7566 | 205c | 0073 | 7464 | 696f | 6669 | 6c65 | 5f5f | 3873 | 7464 | 696f | 6275 | 6646 | 7620 | 5f5f | 6474 | 5f5f | 3873 | 7464 | 696f | 6275 | 6646 |
| 4215200 | 7620 | 3b3b | 3b00 | 6669 | 6c65 | 6275 | 663a | 5428 | 302c | 3730 | 293d | 7336 | 3461 | 6c6c | 6f63 | 5f5f | 3973 | 7472 | 6561 | 6d62 | 7566 | 3a28 | 302c | 3429 |
| 4215260 | 2c30 | 2c31 | 363b | 795f | 756e | 6275 | 665f | 5f39 | 7374 | 7265 | 616d | 6275 | 663a | 2830 | 2c34 | 292c | 3136 | 2c31 | 363b | 795f | 6261 | 7365 | 5f5f | 3973 |
| 4215340 | 7472 | 6561 | 6d62 | 7566 | 3a28 | 302c | 3230 | 292c | 3332 | 2c33 | 323b | 785f | 7062 | 6173 | 655f | 5f39 | 7374 | 7265 | 616d | 6275 | 663a | 2830 | 2c32 | 3029 |
| 4215420 | 2c36 | 342c | 3332 | 3b78 | 5f70 | 7074 | 725f | 5f39 | 7374 | 7265 | 616d | 6275 | 663a | 2830 | 2c32 | 3029 | 2c39 | 362c | 3332 | 3b78 | 5f65 | 7070 | 7472 | 5f5f |
| 4215500 | 3973 | 7472 | 6561 | 6d62 | 7566 | 3a28 | 302c | 3230 | 292c | 3132 | 382c | 3332 | 3b78 | 5f67 | 7074 | 725f | 5f39 | 7374 | 7265 | 616d | 6275 | 663a | 2830 | 2c32 |
| 4215560 | 3029 | 2c31 | 3630 | 2c33 | 323b | 785f | 6567 | 7074 | 725f | 5f39 | 7374 | 7265 | 616d | 6275 | 663a | 2830 | 2c32 | 3029 | 2c31 | 3932 | 2c33 | 323b | 5c00 | 785f |
| 4215640 | 6562 | 6163 | 6b5f | 5f39 | 7374 | 7265 | 616d | 6275 | 663a | 2830 | 2c32 | 3029 | 2c32 | 3234 | 2c33 | 323b | 785f | 626c | 656e | 5f5f | 3973 | 7472 | 6561 | 6d62 |
| 4215720 | 7566 | 3a28 | 302c | 3129 | 2c32 | 3536 | 2c33 | 323b | 5f5f | 7670 | 7472 | 5f5f | 3973 | 7472 | 6561 | 6d62 | 7566 | 3a28 | 302c | 3333 | 292c | 3238 | 382c | 3332 |
| 4216000 | 3b78 | 6664 | 5f5f | 3766 | 696c | 6562 | 7566 | 3a28 | 302c | 3129 | 2c33 | 3230 | 2c33 | 323b | 6d6f | 6465 | 5f5f | 3766 | 696c | 6562 | 7566 | 3a28 | 302c | 3129 |
| 4216060 | 2c33 | 3532 | 2c33 | 323b | 6f70 | 656e | 6564 | 5f5f | 3766 | 696c | 6562 | 7566 | 3a28 | 302c | 3229 | 2c33 | 3834 | 2c38 | 3b6c | 6173 | 745f | 7365 | 656b | 5f5f |
| 4216140 | 3766 | 696c | 6562 | 7566 | 3a28 | 302c | 3129 | 2c34 | 3136 | 2c33 | 323b | 696e | 5f73 | 7461 | 7274 | 5f5f | 3766 | 696c | 6562 | 7566 | 3a28 | 302c | 3230 | 292c |
| 4216220 | 3434 | 382c | 3332 | 3b6c | 6168 | 6561 | 645f | 5f37 | 6669 | 6c65 | 6275 | 663a | 2830 | 2c36 | 3929 | 2c34 | 3830 | 2c31 | 363b | 3b00 | 6f70 | 656e | 7072 | 6f74 |
| 4216300 | 5f5f | 3766 | 696c | 6562 | 7566 | 3a47 | 2830 | 2c31 | 2900 | 6669 | 6c65 | 6275 | 663a | 5a63 | 6669 | 6c65 | 6275 | 663b | 7374 | 7265 | 616d | 6275 | 663b | 5f5f |
| 4216360 | 6374 | 5f5f | 3766 | 696c | 6562 | 7566 | 4676 | 205f | 5f63 | 745f | 5f37 | 6669 | 6c65 | 6275 | 6646 | 6920 | 5f5f | 6374 | 5f5f | 3766 | 696c | 6562 | 7566 | 4669 |
| 4216440 | 5063 | 5431 | 205f | 5f63 | 745f | 5f37 | 6669 | 6c65 | 6275 | 6646 | 5243 | 3766 | 696c | 6562 | 7566 | 2069 | 735f | 6f70 | 656e | 5f5f | 3766 | 696c | 6562 | 7566 |
| 4216520 | 4676 | 2066 | 645f | 5f37 | 6669 | 6c65 | 6275 | 6646 | 7620 | 6f70 | 656e | 5f5f | 3766 | 696c | 6562 | 7566 | 4650 | 4363 | 6954 | 3220 | 6174 | 7461 | 6368 | 5f5f |
| 4216600 | 3766 | 696c | 6562 | 7566 | 4669 | 2063 | 6c6f | 7365 | 5f5f | 3766 | 696c | 6562 | 7566 | 4676 | 205c | 005f | 5f64 | 745f | 5f37 | 6669 | 6c65 | 6275 | 6646 | 7620 |
| 4216660 | 6f76 | 6572 | 666c | 6f77 | 5f5f | 3766 | 696c | 6562 | 7566 | 4669 | 2075 | 6e64 | 6572 | 666c | 6f77 | 5f5f | 3766 | 696c | 6562 | 7566 | 4676 | 2073 | 796e | 635f |
| 4216740 | 5f37 | 6669 | 6c65 | 6275 | 6646 | 7620 | 7365 | 656b | 6f66 | 665f | 5f37 | 6669 | 6c65 | 6275 | 6646 | 6c38 | 7365 | 656b | 5f64 | 6972 | 6920 | 7365 | 7462 | 7566 |
| 4217020 | 5f5f | 3766 | 696c | 6562 | 7566 | 4650 | 6369 | 206c | 6173 | 745f | 6f70 | 5f5f | 3766 | 696c | 6562 | 7566 | 4676 | 203b | 6f70 | 656e | 7072 | 6f74 | 5f5f | 3766 |
| 4217100 | 696c | 6562 | 7566 | 203b | 3b00 | 6673 | 7472 | 6561 | 6d62 | 6173 | 653a | 5428 | 302c | 3731 | 293d | 7331 | 3332 | 5275 | 665f | 5f31 | 3166 | 7374 | 7265 | 616d |
| 4217160 | 6261 | 7365 | 3a28 | 302c | 3730 | 292c | 302c | 3531 | 323b | 5f5f | 7670 | 7472 | 5f5f | 3131 | 6673 | 7472 | 6561 | 6d62 | 6173 | 653a | 2830 | 2c33 | 3329 | 2c35 |

| | | | | | | | | | | | | | | | | | | | | | | | | |
|---|---|---|---|---|---|---|---|---|---|---|---|---|---|---|---|---|---|---|---|---|---|---|---|---|
| 4217240 | 3132 | 2c33 | 323b | 5069 | 6f73 | 3a28 | 302c | 3335 | 292c | 3534 | 342c | 3332 | 3b4f | 696f | 733a | 2830 | 2c32 | 3629 | 2c35 | 3736 | 2c34 | 3830 | 3b3b | 0066 |
| 4217320 | 7374 | 7265 | 616d | 6261 | 7365 | 3a5a | 6366 | 7374 | 7265 | 616d | 6261 | 7365 | 3b69 | 6f73 | 3b5f | 5f63 | 745f | 5f31 | 3166 | 7374 | 7265 | 616d | 6261 | 7365 |
| 4217400 | 4676 | 205f | 5f63 | 745f | 5f31 | 3166 | 7374 | 7265 | 616d | 6261 | 7365 | 4650 | 4363 | 6954 | 3220 | 5f5f | 6374 | 5f5f | 3131 | 6673 | 7472 | 6561 | 6d62 | 6173 |
| 4217460 | 6546 | 6920 | 5f5f | 6374 | 5f5f | 3131 | 6673 | 7472 | 6561 | 6d62 | 6173 | 6546 | 6950 | 6354 | 3120 | 5f5f | 6374 | 5f5f | 3131 | 6673 | 7472 | 6561 | 6d62 | 6173 |
| 4217540 | 6546 | 5231 | 3166 | 7374 | 7265 | 616d | 6261 | 7365 | 205f | 5f64 | 745f | 5f31 | 3166 | 7374 | 7265 | 616d | 6261 | 7365 | 4676 | 206f | 7065 | 6e5f | 5f31 | 3166 |
| 4217620 | 7374 | 7265 | 616d | 6261 | 7365 | 4650 | 4363 | 6954 | 3220 | 5c00 | 6174 | 7461 | 6368 | 5f5f | 3131 | 6673 | 7472 | 6561 | 6d62 | 6173 | 6546 | 6920 | 636c | 6f73 |
| 4217700 | 655f | 5f31 | 3166 | 7374 | 7265 | 616d | 6261 | 7365 | 4676 | 2073 | 6574 | 6275 | 665f | 5f31 | 3166 | 7374 | 7265 | 616d | 6261 | 7365 | 4650 | 6369 | 2072 | 6462 |
| 4217760 | 7566 | 5f5f | 3131 | 6673 | 7472 | 6561 | 6d62 | 6173 | 6546 | 7620 | 7665 | 7269 | 6679 | 5f5f | 3131 | 6673 | 7472 | 6561 | 6d62 | 6173 | 6546 | 6920 | 3b3b | 3b00 |
| 4220040 | 7374 | 6174 | 655f | 7561 | 6c75 | 653a | 7428 | 302c | 3231 | 2900 | 5661 | 6c75 | 655f | 5479 | 7065 | 3a54 | 2830 | 2c37 | 3229 | 3d65 | 554e | 4b4e | 4f57 | 4e56 |
| 4220120 | 3a30 | 2c53 | 5452 | 494e | 473a | 312c | 494e | 5445 | 4745 | 523a | 322c | 464c | 4f41 | 543a | 332c | 3b00 | 426c | 6f63 | 6b5f | 5479 | 7065 | 3a54 | 2830 | 2c37 |
| 4220200 | 3329 | 3d65 | 554e | 4b4e | 4f57 | 4e42 | 3a30 | 2c45 | 4e54 | 4954 | 593a | 312c | 4655 | 4e43 | 5449 | 4f4e | 3a32 | 2c50 | 524f | 4345 | 4455 | 5245 | 3a33 | 2c3b |
| 4220260 | 0045 | 6e74 | 6974 | 795f | 5479 | 7065 | 3a54 | 2830 | 2c37 | 3429 | 3d65 | 554e | 4b4e | 4f57 | 4e45 | 3a30 | 2c41 | 5243 | 4849 | 5445 | 4354 | 5552 | 453a | 312c |
| 4220340 | 5355 | 4250 | 524f | 4752 | 414d | 3a32 | 2c3b | 0050 | 696e | 5f54 | 7970 | 653a | 5428 | 302c | 3735 | 293d | 6555 | 4e4b | 4e4f | 574e | 503a | 302c | 494e | 5049 |
| 4220420 | 4e3a | 312c | 4f55 | 5450 | 494e | 3a32 | 2c49 | 4e4f | 5554 | 5049 | 4e3a | 332c | 3b00 | 5061 | 7261 | 5f43 | 6c61 | 7373 | 3a54 | 2830 | 2c37 | 3629 | 3d65 | 554e |
| 4220500 | 4b4e | 4f57 | 4e43 | 3a30 | 2c46 | 4f52 | 4d41 | 4c3a | 312c | 4143 | 5455 | 414c | 3a32 | 2c52 | 4553 | 4f4c | 5645 | 443a | 332c | 3b00 | 424f | 4f4c | 4541 | 4e3a |
| 4220560 | 5428 | 302c | 3737 | 293d | 6546 | 616c | 7365 | 3a30 | 2c54 | 7275 | 653a | 312c | 3b00 | 426f | 6f6c | 6561 | 6e3a | 5428 | 302c | 3738 | 293d | 6566 | 616c | 7365 |
| 4220640 | 3a30 | 2c74 | 7275 | 653a | 312c | 3b00 | 4275 | 6666 | 6572 | 3a47 | 2830 | 2c32 | 3029 | 004f | 626a | 6563 | 743a | 5428 | 302c | 3739 | 293d | 7334 | 5f5f | 7670 |
| 4220720 | 7472 | 5f5f | 364f | 626a | 6563 | 743a | 2830 | 2c33 | 3329 | 2c30 | 2c33 | 323b | 3b00 | 4f62 | 6a65 | 6374 | 3a5a | 634f | 626a | 6563 | 743b | 3b5f | 5f63 | 745f |
| 4221000 | 5f36 | 4f62 | 6a65 | 6374 | 4676 | 205f | 5f63 | 745f | 5f36 | 4f62 | 6a65 | 6374 | 4652 | 4336 | 4f62 | 6a65 | 6374 | 2065 | 7272 | 6f72 | 4d65 | 6d6f | 7279 | 5f5f |
| 4221060 | 364f | 626a | 6563 | 7446 | 5063 | 5431 | 2065 | 7870 | 6c61 | 696e | 5f5f | 364f | 626a | 6563 | 7446 | 5063 | 2069 | 6e4f | 7264 | 6572 | 5f5f | 364f | 626a | 6563 |
| 4221140 | 7446 | 5036 | 4f62 | 6a65 | 6374 | 2c3b | 3b3b | 005f | 5f70 | 7462 | 6c5f | 5f36 | 4f62 | 6a65 | 6374 | 5f5f | 4d6f | 6447 | 656e | 5f63 | 7878 | 3a47 | 2830 | 2c33 |
| 4221220 | 3329 | 0050 | 463a | 7428 | 302c | 3135 | 2900 | 5046 | 433a | 7428 | 302c | 3135 | 2900 | 5046 | 493a | 7428 | 302c | 3135 | 2900 | 4e4f | 626a | 6563 | 743a | 5428 |
| 4221300 | 302c | 3830 | 293d | 7338 | 5f5f | 7670 | 7472 | 5f5f | 364f | 626a | 6563 | 743a | 2830 | 2c33 | 3329 | 2c30 | 2c33 | 323b | 6e61 | 6d65 | 5f5f | 374e | 4f62 | 6a65 |
| 4221360 | 6374 | 3a28 | 302c | 3230 | 292c | 3332 | 2c33 | 323b | 3b00 | 4e4f | 626a | 6563 | 743a | 5a63 | 4e4f | 626a | 6563 | 743b | 4f62 | 6a65 | 6374 | 3b5f | 5f63 | 745f |
| 4221440 | 5f37 | 4e4f | 626a | 6563 | 7446 | 5063 | 205f | 5f63 | 745f | 5f37 | 4e4f | 626a | 6563 | 7446 | 5243 | 374e | 4f62 | 6a65 | 6374 | 2073 | 6574 | 4e61 | 6d65 | 5f5f |
| 4221520 | 374e | 4f62 | 6a65 | 6374 | 4650 | 6320 | 6765 | 744e | 616d | 655f | 5f37 | 4e4f | 626a | 6563 | 7446 | 7620 | 6578 | 706c | 6169 | 6e5f | 5f37 | 4e4f | 626a | 6563 |
| 4221600 | 7446 | 5063 | 2067 | 6574 | 4174 | 7472 | 5f5f | 374e | 4f62 | 6a65 | 6374 | 4669 | 2067 | 6574 | 5072 | 6f70 | 5f5f | 374e | 4f62 | 6a65 | 6374 | 4650 | 6369 | 2073 |
| 4221660 | 6574 | 5072 | 6f70 | 5f5f | 374e | 4f62 | 6a65 | 6374 | 4650 | 6354 | 3120 | 5c00 | 7365 | 7450 | 726f | 705f | 5f37 | 4e4f | 626a | 6563 | 7446 | 5063 | 6920 | 7365 |
| 4221740 | 7450 | 726f | 705f | 5f37 | 4e4f | 626a | 6563 | 7446 | 5063 | 6620 | 6973 | 4754 | 455f | 5f37 | 4e4f | 626a | 6563 | 7446 | 5036 | 4f62 | 6a65 | 6374 | 2069 | 734c |
| 4222020 | 5445 | 5f5f | 374e | 4f62 | 6a65 | 6374 | 4650 | 364f | 626a | 6563 | 7420 | 3b3b | 3b00 | 6f73 | 7472 | 6561 | 6d5f | 7769 | 7468 | 6173 | 7369 | 676e | 3a54 | 2830 |
| 4222100 | 2c33 | 3929 | 3d73 | 3638 | 5f5f | 7670 | 7472 | 5f5f | 376f | 7374 | 7265 | 616d | 3a28 | 302c | 3333 | 292c | 302c | 3332 | 3b50 | 696f | 733a | 2830 | 2c33 | 3529 |
| 4222160 | 2c33 | 322c | 3332 | 3b4f | 696f | 733a | 2830 | 2c32 | 3629 | 2c36 | 342c | 3438 | 303b | 3b00 | 6f73 | 7472 | 6561 | 6d5f | 7769 | 7468 | 6173 | 7369 | 676e | 3a5a |
| 4222240 | 636f | 7374 | 7265 | 616d | 5f77 | 6974 | 6861 | 7373 | 6967 | 6e3b | 6f73 | 7472 | 6561 | 6d20 | 696f | 733b | 5f5f | 6374 | 5f5f | 3138 | 6f73 | 7472 | 6561 | 6d5f |
| 4222320 | 7769 | 7468 | 6173 | 7369 | 676e | 4676 | 205f | 5f63 | 745f | 5f31 | 386f | 7374 | 7265 | 616d | 5f77 | 6974 | 6861 | 7373 | 6967 | 6e46 | 5231 | 386f | 7374 | 7265 |
| 4222400 | 616d | 5f77 | 6974 | 6861 | 7373 | 6967 | 6e20 | 5f5f | 6474 | 5f5f | 3138 | 6f73 | 7472 | 6561 | 6d5f | 7769 | 7468 | 6173 | 7369 | 676e | 4676 | 205f | 5f61 | 735f |
| 4222460 | 5f31 | 386f | 7374 | 7265 | 616d | 5f77 | 6974 | 6861 | 7373 | 6967 | 6e46 | 5237 | 6f73 | 7472 | 6561 | 6d20 | 5c00 | 5f5f | 6173 | 5f5f | 3138 | 6f73 | 7472 | 6561 |
| 4222540 | 6d5f | 7769 | 7468 | 6173 | 7369 | 676e | 4650 | 3973 | 7472 | 6561 | 6d62 | 7566 | 203b | 3b3b | 0050 | 4642 | 3a74 | 2830 | 2c31 | 3529 | 004c | 4e4f | 626a | 6563 |
| 4222620 | 743a | 5428 | 302c | 3931 | 293d | 7331 | 325f | 5f76 | 7074 | 725f | 5f36 | 4f62 | 6a65 | 6374 | 3a28 | 302c | 3333 | 292c | 302c | 3332 | 3b6e | 616d | 655f | 5f37 |
| 4222700 | 4e4f | 626a | 6563 | 743a | 2830 | 2c32 | 3029 | 2c33 | 322c | 3332 | 3b6e | 6578 | 745f | 5f38 | 4c4e | 4f62 | 6a65 | 6374 | 3a28 | 302c | 3832 | 293d | 2a28 | 302c |
| 4222760 | 3831 | 292c | 3634 | 2c33 | 323b | 3b00 | 4c4e | 4f62 | 6a65 | 6374 | 3a5a | 634c | 4e4f | 626a | 6563 | 743b | 4e4f | 626a | 6563 | 743b | 5f5f | 6374 | 5f5f | 384c |
| 4223040 | 4e4f | 626a | 6563 | 7446 | 5063 | 5038 | 4c4e | 4f62 | 6a65 | 6374 | 205f | 5f63 | 745f | 5f38 | 4c4e | 4f62 | 6a65 | 6374 | 4652 | 4338 | 4c4e | 4f62 | 6a65 | 6374 |
| 4223120 | 2073 | 6574 | 4e65 | 7874 | 5f5f | 384c | 4e4f | 626a | 6563 | 7446 | 5038 | 4c4e | 4f62 | 6a65 | 6374 | 2067 | 6574 | 4e65 | 7874 | 5f5f | 384c | 4e4f | 626a | 6563 |
| 4223200 | 7446 | 7620 | 3b3b | 3b00 | 4c4f | 626a | 6563 | 743a | 5428 | 302c | 3833 | 293d | 7338 | 5f5f | 7670 | 7472 | 5f5f | 364f | 626a | 6563 | 743a | 2830 | 2c33 | 3329 |
| 4223260 | 2c30 | 2c33 | 323b | 6e65 | 7874 | 5f5f | 374c | 4f62 | 6a65 | 6374 | 3a28 | 302c | 3834 | 293d | 2a28 | 302c | 3833 | 292c | 3332 | 2c33 | 323b | 3b00 | 4c4f | 626a |
| 4223340 | 6563 | 743a | 5a63 | 4c4f | 626a | 6563 | 743b | 4f62 | 6a65 | 6374 | 3b5f | 5f63 | 745f | 5f37 | 4c4f | 626a | 6563 | 7446 | 5037 | 4c4f | 626a | 6563 | 7420 | 5f5f |
| 4223420 | 6374 | 5f5f | 374c | 4f62 | 6a65 | 6374 | 4652 | 4337 | 4c4f | 626a | 6563 | 7420 | 7365 | 744e | 6578 | 745f | 5f37 | 4c4f | 626a | 6563 | 7446 | 5037 | 4c4f | 626a |
| 4223500 | 6563 | 7420 | 6765 | 744e | 6578 | 745f | 5f37 | 4c4f | 626a | 6563 | 7446 | 7620 | 3b3b | 3b00 | 4c50 | 4f62 | 6a65 | 6374 | 3a54 | 2830 | 2c38 | 3529 | 3d73 | 3132 |
| 4223560 | 5f5f | 7670 | 7472 | 5f5f | 364f | 626a | 6563 | 743a | 2830 | 2c33 | 3329 | 2c30 | 2c33 | 323b | 6e65 | 7874 | 5f5f | 374c | 4f62 | 6a65 | 6374 | 3a28 | 302c | 3834 |
| 4223640 | 292c | 3332 | 2c33 | 323b | 6e6f | 626a | 7074 | 725f | 5f38 | 4c50 | 4f62 | 6a65 | 6374 | 3a28 | 302c | 3836 | 293d | 2a28 | 302c | 3830 | 292c | 3634 | 2c33 | 323b |
| 4223720 | 3b00 | 4c50 | 4f62 | 6a65 | 6374 | 3a5a | 634c | 504f | 626a | 6563 | 743b | 4c4f | 626a | 6563 | 743b | 5f5f | 6374 | 5f5f | 384c | 504f | 626a | 6563 | 7446 | 5037 |
| 4224000 | 4e4f | 626a | 6563 | 7450 | 374c | 4f62 | 6a65 | 6374 | 205f | 5f63 | 745f | 5f38 | 4c50 | 4f62 | 6a65 | 6374 | 4652 | 4338 | 4c50 | 4f62 | 6a65 | 6374 | 2073 | 6574 |
| 4224060 | 4f62 | 6a65 | 6374 | 5f5f | 384c | 504f | 626a | 6563 | 7446 | 5037 | 4e4f | 626a | 6563 | 7420 | 6765 | 744f | 626a | 6563 | 745f | 5f38 | 4c50 | 4f62 | 6a65 | 6374 |
| 4224140 | 4676 | 2065 | 7870 | 6c61 | 696e | 5f5f | 384c | 504f | 626a | 6563 | 7446 | 5063 | 203b | 3b3b | 005f | 5f70 | 7462 | 6c5f | 5f38 | 4c50 | 4f62 | 6a65 | 6374 | 5f5f |
| 4224220 | 4d6f | 6447 | 656e | 5f63 | 7878 | 3a47 | 2830 | 2c33 | 3329 | 004c | 6973 | 743a | 5428 | 302c | 3837 | 293d | 7331 | 3263 | 6f75 | 6e74 | 5f5f | 344c | 6973 | 743a |
| 4224300 | 2830 | 2c31 | 292c | 302c | 3332 | 3b70 | 7472 | 4c4f | 626a | 6563 | 745f | 5f34 | 4c69 | 7374 | 3a28 | 302c | 3834 | 292c | 3332 | 2c33 | 323b | 5f5f | 7670 | 7472 |

| | | | | | | | | | | | | | | | | | | | | | | | | |
|---|---|---|---|---|---|---|---|---|---|---|---|---|---|---|---|---|---|---|---|---|---|---|---|---|
| 4224360 | 5f5f | 344c | 6973 | 743a | 2830 | 2c33 | 3329 | 2c36 | 342c | 3332 | 3b3b | 004c | 6973 | 743a | 5a63 | 4c69 | 7374 | 3b3b | 5f5f | 6374 | 5f5f | 344c | 6973 | 7446 |
| 4224440 | 7620 | 5f5f | 6374 | 5f5f | 344c | 6973 | 7446 | 5243 | 344c | 6973 | 7420 | 5f5f | 6474 | 5f5f | 344c | 6973 | 7446 | 7620 | 6765 | 7443 | 6f75 | 6e74 | 5f5f | 344c |
| 4224520 | 6973 | 7446 | 7620 | 6765 | 7454 | 6f70 | 5f5f | 344c | 6973 | 7446 | 7620 | 7365 | 7454 | 6f70 | 5f5f | 344c | 6973 | 7446 | 5037 | 4c4f | 626a | 6563 | 7420 | 6572 |
| 4224600 | 726f | 724d | 656d | 6f72 | 795f | 5f34 | 4c69 | 7374 | 4650 | 6354 | 3120 | 6272 | 6f61 | 6463 | 6173 | 745f | 5f34 | 4c69 | 7374 | 464d | 364f | 626a | 6563 | 7446 |
| 4224660 | 765f | 7620 | 6578 | 706c | 6169 | 6e5f | 5f34 | 4c69 | 7374 | 4650 | 6320 | 5c00 | 696e | 7365 | 7274 | 5f5f | 344c | 6973 | 7446 | 5037 | 4c4f | 626a | 6563 | 7420 |
| 4224740 | 6973 | 4d65 | 6d62 | 6572 | 5f5f | 344c | 6973 | 7446 | 5037 | 4c4f | 626a | 6563 | 7420 | 6973 | 4d65 | 6d62 | 6572 | 5f5f | 344c | 6973 | 7446 | 5063 | 2069 | 7345 |
| 4225020 | 7175 | 616c | 5f5f | 344c | 6973 | 7446 | 5234 | 4c69 | 7374 | 2972 | 656d | 6f76 | 655f | 5f34 | 4c69 | 7374 | 4650 | 6320 | 3b3b | 3b00 | 5f5f | 7074 | 626c | 5f5f |
| 4225100 | 344c | 6973 | 745f | 5f4d | 6f64 | 4765 | 6e5f | 6378 | 783a | 4728 | 302c | 3333 | 2900 | 504c | 6973 | 743a | 5428 | 302c | 3838 | 293d | 7331 | 3263 | 6f75 | 6e74 |
| 4225160 | 5f5f | 344c | 6973 | 743a | 2830 | 2c31 | 292c | 302c | 3332 | 3b70 | 7472 | 4c4f | 626a | 6563 | 745f | 5f34 | 4c69 | 7374 | 3a28 | 302c | 3834 | 292c | 3332 | 2c33 |
| 4225240 | 323b | 5f5f | 7670 | 7472 | 5f5f | 344c | 6973 | 743a | 2830 | 2c33 | 3329 | 2c36 | 342c | 3332 | 3b3b | 0050 | 4c69 | 7374 | 3a5a | 6350 | 4c69 | 7374 | 3b4c | 6973 |
| 4225320 | 743b | 696e | 7365 | 7274 | 5f5f | 3550 | 4c69 | 7374 | 4650 | 384c | 504f | 626a | 6563 | 7420 | 696e | 7365 | 7274 | 5f5f | 3550 | 4c69 | 7374 | 4652 | 3550 | 4c69 |
| 4225400 | 7374 | 2053 | 6f72 | 745f | 504c | 6973 | 745f | 5f35 | 504c | 6973 | 7446 | 6920 | 7265 | 7665 | 7273 | 655f | 5f35 | 504c | 6973 | 7446 | 7620 | 696e | 7365 | 7274 |
| 4225460 | 4166 | 7465 | 725f | 5f35 | 504c | 6973 | 7446 | 5038 | 4c50 | 4f62 | 6a65 | 6374 | 5431 | 2072 | 656d | 6f76 | 655f | 5f35 | 504c | 6973 | 7446 | 5038 | 4c50 | 4f62 |
| 4225540 | 6a65 | 6374 | 2072 | 656d | 6f76 | 655f | 5f35 | 504c | 6973 | 7446 | 5063 | 2069 | 734d | 656d | 6265 | 725f | 5f35 | 504c | 6973 | 7446 | 5063 | 205c | 0069 | 734d |
| 4225620 | 656d | 6265 | 725f | 5f35 | 504c | 6973 | 7446 | 5037 | 4c4f | 626a | 6563 | 7420 | 6973 | 4571 | 7561 | 6c5f | 5f35 | 504c | 6973 | 7446 | 5234 | 4c69 | 7374 | 2065 |
| 4225700 | 7870 | 6c61 | 696e | 5f5f | 3550 | 4c69 | 7374 | 4650 | 6320 | 5f5f | 6374 | 5f5f | 3550 | 4c69 | 7374 | 4652 | 4335 | 504c | 6973 | 7420 | 5f5f | 6374 | 5f5f | 3550 |
| 4225760 | 4c69 | 7374 | 4676 | 203b | 3b3b | 005f | 5f70 | 7462 | 6c5f | 5f35 | 504c | 6973 | 745f | 5f4d | 6f64 | 4765 | 6e5f | 6378 | 783a | 4728 | 302c | 3333 | 2900 | 4c69 |
| 4226040 | 7374 | 4974 | 6572 | 6174 | 6f72 | 3a54 | 2830 | 2c38 | 3929 | 3d73 | 386c | 6973 | 745f | 5f31 | 324c | 6973 | 7449 | 7465 | 7261 | 746f | 723a | 2830 | 2c39 | 3029 |
| 4226120 | 332a | 2830 | 2c38 | 3729 | 2c30 | 2c33 | 323b | 705f | 5f31 | 324c | 6973 | 7449 | 7465 | 7261 | 746f | 723a | 2830 | 2c38 | 3429 | 2c33 | 322c | 3332 | 3b3b | 004c |
| 4226200 | 6973 | 7449 | 7465 | 7261 | 746f | 723a | 5a63 | 4c69 | 7374 | 4974 | 6572 | 6174 | 6f72 | 3b3b | 5f5f | 6374 | 5f5f | 3132 | 4c69 | 7374 | 4974 | 6572 | 6174 | 6f72 |
| 4226260 | 4652 | 344c | 6973 | 7420 | 7265 | 7365 | 745f | 5f31 | 324c | 6973 | 7449 | 7465 | 7261 | 746f | 7246 | 7620 | 6174 | 7461 | 6368 | 5f5f | 3132 | 4c69 | 7374 | 4974 |
| 4226340 | 6572 | 6174 | 6f72 | 4652 | 344c | 6973 | 7420 | 6765 | 7443 | 7572 | 7265 | 6e74 | 5f5f | 3132 | 4c69 | 7374 | 4974 | 6572 | 6174 | 6f72 | 4676 | 205f | 5f70 | 705f |
| 4226420 | 5f31 | 324c | 6973 | 7449 | 7465 | 7261 | 746f | 7246 | 7620 | 3b3b | 3b00 | 5069 | 6e4c | 656e | 6774 | 683a | 5428 | 302c | 3931 | 293d | 7331 | 365f | 5f76 | 7074 |
| 4226500 | 725f | 5f36 | 4f62 | 6a65 | 6374 | 3a28 | 302c | 3333 | 292c | 302c | 3332 | 3b6e | 616d | 655f | 5f37 | 4e4f | 626a | 6563 | 743a | 2830 | 2c32 | 3029 | 2c33 | 322c |
| 4226560 | 3332 | 3b43 | 6c65 | 6e67 | 7468 | 5f5f | 3950 | 696e | 4c65 | 6e67 | 7468 | 3a28 | 302c | 3230 | 292c | 3634 | 2c33 | 323b | 496c | 656e | 6774 | 685f | 5f39 | 5069 |
| 4226640 | 6e4c | 656e | 6774 | 683a | 2830 | 2c31 | 292c | 3936 | 2c33 | 323b | 3b00 | 5069 | 6e4c | 656e | 6774 | 683a | 5a63 | 5069 | 6e4c | 656e | 6774 | 683b | 4e4f | 626a |
| 4226720 | 6563 | 743b | 5f5f | 6374 | 5f5f | 3950 | 696e | 4c65 | 6e67 | 7468 | 4650 | 6354 | 3120 | 5f5f | 6374 | 5f5f | 3950 | 696e | 4c65 | 6e67 | 7468 | 4652 | 4339 | 5069 |
| 4227000 | 6e4c | 656e | 6774 | 6820 | 7365 | 745f | 5069 | 6e4c | 656e | 6774 | 685f | 5f39 | 5069 | 6e4c | 656e | 6774 | 6846 | 5063 | 5431 | 2067 | 6574 | 5f49 | 5f50 | 696e |
| 4227060 | 4c65 | 6e67 | 7468 | 5f5f | 3950 | 696e | 4c65 | 6e67 | 7469 | 4676 | 2067 | 6574 | 5f49 | 5f50 | 696e | 4c65 | 6e67 | 7468 | 5f5f | 3950 | 696e | 4c65 | 6e67 | 7468 |
| 4227140 | 4669 | 203b | 3b3b | 004d | 6f64 | 4765 | 6e3a | 5428 | 302c | 3932 | 293d | 7332 | 3442 | 6974 | 5769 | 6474 | 685f | 5f36 | 4d6f | 6447 | 656e | 3a28 | 302c | 3129 |
| 4227220 | 2c30 | 2c33 | 323b | 4553 | 7461 | 7465 | 5f5f | 364d | 6f64 | 4765 | 6e3a | 2830 | 2c37 | 3929 | 2c33 | 322c | 3332 | 3b50 | 696e | 4e61 | 6d65 | 4c65 | 6e67 | 7468 |
| 4227300 | 5f5f | 364d | 6f64 | 4765 | 6e3a | 2830 | 2c38 | 3829 | 2c36 | 342c | 3936 | 3b5f | 5f76 | 7074 | 725f | 5f36 | 4d6f | 6447 | 656e | 3a28 | 302c | 3333 | 292c | 3136 |
| 4227360 | 302c | 3332 | 3b3b | 004d | 6f64 | 4765 | 6e3a | 5a63 | 4d6f | 6447 | 656e | 3b3b | 5f5f | 6374 | 5f5f | 364d | 6f64 | 4765 | 6e46 | 7620 | 5f5f | 6374 | 5f5f | 364d |
| 4227440 | 6f64 | 4765 | 6e46 | 5243 | 364d | 6f64 | 4765 | 6e20 | 7365 | 745f | 4269 | 7457 | 6964 | 7468 | 5f5f | 364d | 6f64 | 4765 | 6e46 | 6920 | 7365 | 745f | 4553 | 7461 |
| 4227520 | 7465 | 5f5f | 364d | 6f64 | 4765 | 6e46 | 3742 | 6f6f | 6c65 | 616e | 2067 | 6574 | 5f45 | 5374 | 6174 | 655f | 5f36 | 4d6f | 6447 | 656e | 4676 | 2073 | 6574 | 5f50 |
| 4227600 | 696e | 4c65 | 6e67 | 7468 | 5f5f | 364d | 6f64 | 4765 | 6e46 | 5063 | 5431 | 2067 | 6574 | 5f50 | 696e | 4c65 | 6e67 | 7468 | 5f5f | 364d | 6f64 | 4765 | 6e46 | 5063 |
| 4227660 | 2073 | 6574 | 496e | 6465 | 785f | 5f36 | 4d6f | 6447 | 656e | 4676 | 205c | 0073 | 6574 | 4e61 | 6d65 | 496e | 6465 | 785f | 5f36 | 4d6f | 6447 | 656e | 4650 | 6320 |
| 4227740 | 4c6f | 6164 | 5f56 | 4844 | 4c5f | 4461 | 7461 | 5f5f | 364d | 6f64 | 4765 | 6e46 | 5037 | 4e4f | 626a | 6563 | 7420 | 436f | 6d70 | 6f73 | 655f | 4d6f | 6447 | 656e |
| 4230020 | 5f44 | 6573 | 6372 | 6970 | 746f | 725f | 5f36 | 4d6f | 6447 | 656e | 4650 | 6320 | 6578 | 706c | 6169 | 6e5f | 5f36 | 4d6f | 6447 | 656e | 4676 | 205f | 5f64 | 745f |
| 4230100 | 5f36 | 4d6f | 6447 | 656e | 4676 | 203b | 3b3b | 005f | 5f70 | 7462 | 6c5f | 5f36 | 4d6f | 6447 | 656e | 5f5f | 4d5f | 6447 | 656e | 5f63 | 7878 | 3a47 | 2830 | 2c33 |
| 4230160 | 3329 | 0074 | 656d | 704d | 473a | 4728 | 302c | 3230 | 2900 | 4d6f | 6447 | 656e | 2e63 | 7878 | 0065 | 7870 | 6c61 | 696e | 5f5f | 364d | 6f64 | 4765 | 6e46 | 763a |
| 4230240 | 4628 | 302c | 3229 | 005f | 5f30 | 7468 | 6973 | 3a70 | 2830 | 2c39 | 3329 | 3d2a | 2830 | 2c39 | 3229 | 005f | 5f30 | 7468 | 6973 | 3a72 | 2830 | 2c39 | 3329 | 005f |
| 4230320 | 5f30 | 7468 | 6973 | 203a | 5a74 | 6c00 | 6578 | 706c | 6169 | 6e5f | 5f36 | 4d6f | 6447 | 656e | 4676 | 203a | 5a74 | 4600 | 5f5f | 6374 | 5f5f | 3950 | 696e | 4c65 |
| 4230400 | 6e67 | 7468 | 4650 | 6354 | 313a | 6628 | 302c | 3934 | 2934 | 2a28 | 302c | 3931 | 2900 | 5f5f | 3074 | 6869 | 733a | 7028 | 302c | 3934 | 2900 | 5f5f | 306e | 3a70 |
| 4230460 | 2830 | 2c32 | 3029 | 005f | 5f30 | 6c3a | 7028 | 302c | 3230 | 2900 | 2e2f | 6878 | 782f | 4d6f | 6447 | 656e | 2e68 | 7878 | 005f | 5f30 | 7468 | 6973 | 3a72 | 2830 |
| 4230540 | 2c39 | 3429 | 005f | 5f30 | 7468 | 6973 | 203a | 5a74 | 6c00 | 5f5f | 306e | 203a | 5a74 | 6c00 | 5f5f | 306c | 203a | 5a74 | 6c00 | 5f5f | 6374 | 5f5f | 3950 | 696e |
| 4230620 | 4c65 | 6e67 | 7468 | 4650 | 6354 | 3120 | 3a5a | 7446 | 0073 | 6574 | 5f50 | 696e | 4c65 | 6e67 | 7468 | 5f5f | 364d | 6f64 | 4765 | 6e46 | 5063 | 5431 | 3a46 | 2830 |
| 4230700 | 2c32 | 2900 | 5f5f | 3074 | 6869 | 733a | 7028 | 302c | 3933 | 2900 | 5f5f | 306e | 3a70 | 2830 | 2c32 | 3029 | 005f | 5f30 | 6c3a | 7028 | 302c | 3230 | 2900 | 4d6f |
| 4230760 | 6447 | 656e | 2e63 | 7878 | 005f | 5f30 | 7468 | 6973 | 3a72 | 2830 | 2c39 | 3329 | 005f | 5f31 | 4e50 | 7472 | 3a28 | 302c | 3936 | 2900 | 5f5f | 314c | 5050 | 7472 |
| 4231040 | 3a28 | 302c | 3935 | 2934 | 2a28 | 302c | 3835 | 2900 | 5f5f | 305f | 5f58 | 7468 | 6973 | 3030 | 7976 | 697a | 6f67 | 3a28 | 302c | 3935 | 2900 | 5f5f | 305f | 5f58 |
| 4231120 | 6e30 | 3079 | 7669 | 7a6f | 673a | 2830 | 2c38 | 3629 | 005f | 5f30 | 5f5f | 5874 | 6869 | 7330 | 3061 | 7634 | 796d | 673a | 2830 | 2c38 | 3429 | 005f | 5f30 | 5f5f |
| 4231200 | 586f | 3030 | 6176 | 3479 | 6d67 | 3a28 | 302c | 3834 | 2900 | 5f5f | 3074 | 6869 | 7320 | 3a5a | 746c | 005f | 5f30 | 6e20 | 3a5a | 746c | 005f | 5f30 | 6c20 | 3a5a |
| 4231260 | 746c | 005f | 5f31 | 4e50 | 7472 | 203a | 5a74 | 6c00 | 5f5f | 314c | 5050 | 7472 | 203a | 5a74 | 6c00 | 5f5f | 305f | 5f58 | 7468 | 6973 | 3030 | 7976 | 697a | 6f67 |
| 4231340 | 203a | 5a74 | 6c00 | 5f5f | 305f | 5f58 | 6e30 | 3079 | 7669 | 7a6f | 6720 | 3a5a | 746c | 005f | 5f30 | 5f5f | 5874 | 6869 | 7330 | 3061 | 7634 | 796d | 6720 | 3a5a |
| 4231420 | 746c | 005f | 5f30 | 5f5f | 586f | 3030 | 6176 | 3479 | 6d67 | 203a | 5a74 | 6c00 | 7365 | 745f | 5069 | 6e4c | 656e | 6774 | 685f | 5f36 | 4d6f | 6447 | 656e | 4650 |

| | | | | | | | | | | | | | | | | | | | | | | | | |
|---|---|---|---|---|---|---|---|---|---|---|---|---|---|---|---|---|---|---|---|---|---|---|---|---|
| 4231500 | 6354 | 3120 | 3a5a | 7446 | 0067 | 6574 | 5f50 | 696e | 4c65 | 6e67 | 7468 | 5f5f | 364d | 6f64 | 4765 | 6e46 | 5063 | 3a46 | 2830 | 2c31 | 2900 | 5f5f | 3074 | 6869 |
| 4231560 | 733a | 7028 | 302c | 3333 | 2900 | 5f5f | 306e | 3a70 | 2830 | 2c32 | 3029 | 005f | 5f30 | 7468 | 6973 | 3a72 | 2830 | 2c39 | 3329 | 005f | 5f31 | 504c | 3a28 | 302c |
| 4231640 | 3934 | 2900 | 5f5f | 314e | 5074 | 723a | 2830 | 2c38 | 3629 | 005f | 5f31 | 5069 | 6e4c | 656e | 3a28 | 302c | 3129 | 005f | 5f30 | 7468 | 6973 | 203a | 5a74 | 6c00 |
| 4231720 | 5f5f | 306e | 203a | 5a74 | 6c00 | 5f5f | 3150 | 4c20 | 3a5a | 746c | 005f | 5f31 | 4e50 | 7472 | 203a | 5a74 | 6c00 | 5f5f | 3150 | 696e | 4c65 | 6e20 | 3a5a | 746c |
| 4232000 | 0067 | 6574 | 5f50 | 696e | 4c65 | 6e67 | 7468 | 5f5f | 364d | 6f64 | 4765 | 6e46 | 5063 | 203a | 5a74 | 4600 | 6765 | 745f | 495f | 5069 | 6e4c | 656e | 6774 | 685f |
| 4232060 | 5f39 | 5069 | 6e4c | 656e | 6774 | 6846 | 693a | 4628 | 302c | 3129 | 005f | 5f30 | 7468 | 6973 | 3a70 | 2830 | 2c39 | 3429 | 005f | 5f30 | 4c3a | 7028 | 302c | 3129 |
| 4232140 | 005f | 5f30 | 7468 | 6973 | 3a72 | 2830 | 2c39 | 3429 | 005f | 5f30 | 7468 | 6973 | 203a | 5a74 | 6c00 | 5f5f | 304c | 203a | 5a74 | 6c00 | 6765 | 745f | 495f | 5069 |
| 4232220 | 6e4c | 656e | 6774 | 695f | 5f39 | 5069 | 6e4c | 656e | 6774 | 6846 | 6920 | 3a5a | 7446 | 005f | 5f73 | 7469 | 5f5f | 436f | 6447 | 656e | 5f63 | 7878 | 5f74 | 656d |
| 4232300 | 704d | 475f | 3a46 | 2930 | 2c32 | 2900 | 2f75 | 7372 | 2f43 | 432f | 7375 | 6e34 | 2f69 | 6e63 | 6c2f | 696f | 7374 | 7265 | 616d | 2e68 | 004d | 6f64 | 4765 | 6e2e |
| 4232360 | 6378 | 7800 | 5f5f | 7174 | 645f | 5f4d | 6f64 | 4765 | 6e5f | 6378 | 785f | 7465 | 6470 | 4347 | 5f3a | 4628 | 302c | 3229 | 002f | 7573 | 722f | 4343 | 2f73 | 756e |
| 4232440 | 342f | 696e | 636c | 2f69 | 6f73 | 7472 | 6561 | 6d2e | 6800 | 5f5f | 7674 | 626c | 5f5f | 364d | 6f64 | 4765 | 6e3a | 4728 | 302c | 3936 | 293d | 6172 | 2830 | 2c31 |
| 4232520 | 293b | 303b | 363b | 2930 | 2c31 | 3529 | 005f | 5f76 | 7462 | 6c5f | 5f38 | 4c50 | 4f62 | 6a65 | 6374 | 5f5f | 4d6f | 6447 | 656e | 5f63 | 7878 | 3a47 | 2830 | 2c39 |
| 4232600 | 3729 | 3d61 | 7228 | 302c | 3129 | 3b30 | 3b33 | 3b28 | 302c | 3135 | 2900 | 436f | 6470 | 6f73 | 655f | 4d6f | 6447 | 656e | 5f44 | 6573 | 6372 | 6970 | 746f | 725f |
| 4232660 | 5f36 | 4d6f | 6447 | 656e | 4650 | 633a | 6628 | 302c | 3230 | 2900 | 5f5f | 3074 | 6869 | 733a | 7028 | 302c | 3933 | 2900 | 5f5f | 305f | 5f41 | 3533 | 3a70 | 2830 |
| 4232740 | 2c32 | 3029 | 002e | 2f68 | 7878 | 2f4d | 6f64 | 4765 | 6e2e | 6878 | 7800 | 5f5f | 3074 | 6869 | 7320 | 3a5a | 746c | 005f | 5f30 | 5f5f | 4135 | 3320 | 3a5a | 746c |
| 4233020 | 0043 | 6f6d | 706f | 7365 | 5f4d | 6f64 | 4765 | 6e5f | 4465 | 7363 | 7269 | 7074 | 6f72 | 5f5f | 364d | 6f64 | 4765 | 6e46 | 5063 | 203a | 5a74 | 4600 | 4c6f | 6164 |
| 4233100 | 5f56 | 4844 | 4c5f | 4461 | 7461 | 5f5f | 364d | 6f64 | 4765 | 6e46 | 5037 | 4e4f | 626a | 6563 | 743a | 6628 | 302c | 3229 | 005f | 5f30 | 7468 | 6973 | 3a70 | 2830 |
| 4233160 | 2c39 | 3329 | 005f | 5f31 | 5f5f | 4135 | 323a | 7028 | 302c | 3836 | 2900 | 5f5f | 3074 | 6869 | 7320 | 3a5a | 746c | 005f | 5f31 | 5f5f | 4135 | 3220 | 3a5a | 746c |
| 4233240 | 004c | 6f61 | 645f | 5648 | 444c | 5f44 | 6174 | 615f | 5f36 | 4d6f | 6447 | 656e | 4650 | 374e | 4f62 | 6a65 | 6374 | 203a | 5a74 | 4600 | 7365 | 744e | 616d | 6549 |
| 4233320 | 6e64 | 6578 | 5f5f | 364d | 6f64 | 4765 | 6e46 | 5063 | 3a66 | 2830 | 2c32 | 2900 | 5f5f | 3074 | 6869 | 733a | 7028 | 302c | 3933 | 2900 | 5f5f | 315f | 5f41 | 3531 |
| 4233400 | 3a70 | 2830 | 2c32 | 3029 | 005f | 5f30 | 7468 | 6973 | 203a | 5a74 | 6c00 | 5f5f | 315f | 5f41 | 3531 | 203a | 5a74 | 6c00 | 7365 | 744e | 616d | 6549 | 6e64 | 6578 |
| 4233460 | 5f5f | 364d | 6f64 | 4765 | 6e46 | 5063 | 203a | 5a74 | 4600 | 7365 | 7449 | 6e64 | 6578 | 5f5f | 364d | 6f64 | 4765 | 6e46 | 763a | 6628 | 302c | 3229 | 005f | 5f30 |
| 4233540 | 7468 | 6973 | 3a70 | 2930 | 2c39 | 3329 | 005f | 5f30 | 7468 | 6973 | 203a | 5a74 | 6c00 | 7365 | 7449 | 6e64 | 6578 | 5f5f | 364d | 6f64 | 4765 | 6e46 | 7620 | 3a5a |
| 4233620 | 7446 | 0065 | 7870 | 6c61 | 696e | 5f5f | 384c | 504f | 626a | 6563 | 7446 | 5063 | 3a66 | 2830 | 2c32 | 2900 | 5f5f | 3074 | 6869 | 733a | 7028 | 302c | 3935 | 2900 |
| 4233700 | 5f5f | 3073 | 3a70 | 2830 | 2c32 | 3029 | 002f | 686f | 6d65 | 2f6f | 7361 | 7331 | 2f61 | 2f61 | 622f | 7372 | 632f | 6e65 | 776f | 626a | 6563 | 7473 | 2f68 | 7878 |
| 4233760 | 2f4c | 504f | 626a | 6563 | 745f | 6462 | 2e68 | 7878 | 005f | 5f30 | 7468 | 6973 | 3a72 | 2830 | 2c39 | 3529 | 005f | 5f30 | 7468 | 6973 | 203a | 5a74 | 6c00 | 5f5f |
| 4234040 | 3073 | 203a | 5a74 | 6c00 | 6578 | 706c | 6169 | 6e5f | 5f38 | 4c50 | 4f62 | 6a65 | 6374 | 4650 | 6320 | 3a5a | 7446 | 0069 | 6e4f | 7264 | 6572 | 5f5f | 364f | 626a |
| 4234120 | 6563 | 7446 | 5036 | 4f62 | 6a65 | 6374 | 3a66 | 2830 | 2c31 | 2900 | 5f5f | 3074 | 6869 | 733a | 7028 | 302c | 3938 | 293d | 2a28 | 302c | 3739 | 2900 | 5f5f | 305f |
| 4234200 | 5f41 | 3237 | 3a70 | 2930 | 2c39 | 3829 | 002f | 686f | 6d65 | 2f6f | 7361 | 7331 | 2f61 | 2f61 | 622f | 7372 | 632f | 6e65 | 776f | 626a | 6563 | 7473 | 2f68 | 7878 |
| 4234260 | 2f4f | 626a | 6563 | 745f | 6462 | 2e68 | 7878 | 005f | 5f30 | 7468 | 6973 | 203a | 5a74 | 6c00 | 5f5f | 305f | 5f41 | 3237 | 203a | 5a74 | 6c00 | 696e | 4f72 | 6465 |
| 4234340 | 725f | 5f36 | 4f62 | 6a65 | 6374 | 4650 | 364f | 626a | 6563 | 7420 | 3a5a | 7446 | 004d | 475f | 4d61 | 6e61 | 6765 | 722e | 6f00 | 5f5f | 5f63 | 745f | 5f33 | 4d75 |
| 4234420 | 7846 | 7600 | 5f5f | 5f63 | 745f | 5f37 | 436f | 756e | 7465 | 7246 | 7600 | 5f5f | 5f63 | 745f | 5f37 | 4465 | 636f | 6465 | 7246 | 7600 | 5f70 | 7574 | 5f5f | 376f |
| 4234500 | 7374 | 7265 | 616d | 4663 | 005f | 5f5f | 6374 | 5f5f | 3446 | 6966 | 6f46 | 7600 | 5f5f | 5f63 | 745f | 5f31 | 3144 | 4963 | 7265 | 6d65 | 6e74 | 6f72 | 4676 | 005f |
| 4234560 | 696f | 7374 | 7265 | 616d | 5f69 | 6e69 | 7400 | 5f5f | 5f63 | 745f | 5f35 | 4164 | 6465 | 7246 | 7600 | 5f65 | 7870 | 6c61 | 696e | 5f5f | 384c | 504f | 626a | 6563 |
| 4234640 | 7446 | 5063 | 005f | 696e | 4f72 | 6465 | 725f | 5f36 | 4f62 | 6a65 | 6374 | 4650 | 364f | 626a | 6563 | 7400 | 2f68 | 6f6d | 652f | 6f73 | 6173 | 312f | 612f | 6162 |
| 4234720 | 2f73 | 7263 | 2f6e | 6577 | 6f62 | 6a65 | 6374 | 732f | 7072 | 6f67 | 2f4d | 472f | 432b | 2b2e | 3232 | 3930 | 352f | 004d | 475f | 4d61 | 6e61 | 6765 | 722e | 6300 |
| 4235000 | 4d47 | 5f4d | 616e | 6167 | 6572 | 2e63 | 7878 | 0069 | 6e74 | 3a74 | 2830 | 2c31 | 293d | 7228 | 302c | 3129 | 3b2d | 3231 | 3437 | 3438 | 3336 | 3438 | 3b32 | 3134 |
| 4235060 | 3734 | 3833 | 3634 | 373b | 0063 | 6861 | 723a | 7428 | 302c | 3229 | 3d72 | 2830 | 2c32 | 293b | 303b | 3132 | 373b | 006c | 6f6e | 673a | 7428 | 302c | 3329 | 3d72 |
| 4235140 | 2830 | 2c31 | 293b | 2132 | 3134 | 3734 | 3833 | 3634 | 383b | 3231 | 3437 | 3438 | 3336 | 3437 | 3b00 | 7368 | 6f72 | 743a | 7428 | 302c | 3429 | 3d72 | 2830 | 2c31 |
| 4235220 | 293b | 2d33 | 3237 | 3638 | 3b33 | 3237 | 3637 | 3b00 | 756e | 7369 | 676e | 6564 | 2063 | 6861 | 723a | 7428 | 302c | 3529 | 3d72 | 2830 | 2c31 | 293b | 303b | 3235 |
| 4235300 | 353b | 0075 | 6e73 | 6967 | 6e65 | 6420 | 7368 | 6f72 | 743a | 7428 | 302c | 3629 | 3d72 | 2830 | 2c31 | 293b | 303b | 3635 | 3533 | 353b | 0075 | 6e73 | 6967 | 6e65 |
| 4235360 | 6420 | 6c6f | 6e67 | 3a74 | 2830 | 2c37 | 293d | 7228 | 302c | 3129 | 3b30 | 3b2d | 313b | 0075 | 6e73 | 6967 | 6e65 | 6420 | 696e | 743a | 7428 | 302c | 3829 | 3d72 |
| 4235440 | 2830 | 2c31 | 293b | 303b | 2d31 | 3b00 | 666c | 6f61 | 743a | 7428 | 302c | 3929 | 3d72 | 2830 | 2c31 | 293b | 343b | 303b | 0064 | 6f75 | 626c | 653a | 7428 | 302c |
| 4235520 | 3130 | 293d | 7228 | 302c | 3129 | 3b38 | 3b30 | 3b00 | 766f | 6964 | 3a74 | 2830 | 2c31 | 3129 | 3d28 | 302c | 3131 | 2900 | 3f3f | 3f3a | 7428 | 302c | 3132 | 293d |
| 4235600 | 2830 | 2c31 | 2900 | 5f5f | 7670 | 7470 | 3a74 | 2830 | 2c31 | 3329 | 3d2a | 2830 | 2c31 | 3429 | 3d66 | 2830 | 2c31 | 2900 | 5f5f | 6470 | 7472 | 3a54 | 2830 | 2c31 |
| 4235660 | 3529 | 3d73 | 3864 | 3a28 | 302c | 3429 | 2c30 | 2c31 | 363b | 693a | 2830 | 2c34 | 292c | 3136 | 2c31 | 363b | 663a | 2830 | 2c31 | 3329 | 2c33 | 322c | 3332 | 3b3b |
| 4235740 | 005f | 5046 | 565f | 3a74 | 2830 | 2c31 | 3629 | 3d2a | 2830 | 2c31 | 3729 | 3d66 | 2830 | 2c32 | 2900 | 5f50 | 4649 | 5f3a | 7428 | 302c | 3133 | 2900 | 6572 | 726e |
| 4236020 | 6f3a | 4728 | 302c | 3129 | 0073 | 7973 | 5f6e | 6572 | 723a | 4728 | 302c | 3129 | 0065 | 6e76 | 6972 | 6f6e | 3a47 | 2830 | 2c31 | 3929 | 3d2a | 2830 | 2c32 | 3029 |
| 4236100 | 3d2a | 2830 | 2c32 | 2900 | 656e | 643a | 4728 | 302c | 3129 | 0065 | 7465 | 7074 | 3a47 | 2830 | 2c31 | 2900 | 6564 | 6174 | 613a | 4728 | 302c | 3129 | 006f | 7074 |
| 4236160 | 6172 | 673a | 4728 | 302c | 3230 | 2900 | 6f70 | 7469 | 6e64 | 3a47 | 2830 | 2c31 | 2900 | 6f70 | 7465 | 7272 | 3a47 | 2830 | 2c31 | 2900 | 7074 | 7264 | 6966 | 665f |
| 4236240 | 743a | 7428 | 302c | 3129 | 0073 | 697a | 655f | 743a | 7428 | 302c | 3829 | 0073 | 7472 | 6561 | 6d70 | 6f73 | 3a74 | 2830 | 2c31 | 2900 | 7374 | 7265 | 616d | 6f66 |
| 4236320 | 653a | 7428 | 302c | 3129 | 0069 | 6f5f | 7374 | 6174 | 653a | 5428 | 302c | 3231 | 293d | 6567 | 6f6f | 6462 | 6974 | 5f5f | 696f | 5f73 | 7461 | 7465 | 3a30 | 2c65 |
| 4236400 | 6f66 | 6269 | 745f | 5f69 | 6f5f | 7374 | 6174 | 653a | 312c | 6661 | 696c | 6269 | 745f | 5f69 | 6f5f | 7374 | 6174 | 653a | 322c | 6261 | 6462 | 6974 | 5f5f | 696f |
| 4236460 | 5f73 | 7461 | 7465 | 3a33 | 2c68 | 6172 | 6466 | 6169 | 6c5f | 5f69 | 6f5f | 7374 | 6174 | 653a | 342c | 3b00 | 6f70 | 656e | 5f6d | 6f64 | 653a | 5428 | 302c | 3232 |
| 4236540 | 293d | 6569 | 6e5f | 5f6f | 7065 | 6e5f | 6d6f | 6465 | 3a30 | 2c6f | 7574 | 5f5f | 6f70 | 656e | 5f6d | 6f64 | 653a | 312c | 6174 | 655f | 5f6f | 7065 | 6e5f | 6d6f |

| | | | | | | | | | | | | | | | | | | | | | | | | |
|---|---|---|---|---|---|---|---|---|---|---|---|---|---|---|---|---|---|---|---|---|---|---|---|---|
| 4236620 | 6465 | 3a32 | 2c61 | 7070 | 5f5f | 6f70 | 656e | 5f6d | 6f64 | 653a | 332c | 7472 | 756e | 635f | 5f6f | 7065 | 6e5f | 6d6f | 6465 | 3a34 | 2c6e | 6f63 | 7265 | 6174 |
| 4236700 | 655f | 5f6f | 7065 | 6e5f | 6d6f | 6465 | 3a35 | 2c6e | 6f72 | 6570 | 6c61 | 6365 | 5f5f | 6f70 | 656e | 5f6d | 6f64 | 653a | 362c | 3b00 | 7365 | 656b | 5f64 | 6972 |
| 4236760 | 3a54 | 2830 | 2c32 | 3329 | 3d65 | 6265 | 675f | 5f73 | 6565 | 6b5f | 6469 | 723a | 302c | 6375 | 725f | 5f73 | 6565 | 6b5f | 6469 | 723a | 312c | 656e | 645f | 5f73 |
| 4237040 | 6565 | 6b5f | 6469 | 723a | 322c | 3b00 | 5f5f | 4531 | 3a54 | 2830 | 2c32 | 3429 | 3d65 | 736b | 6970 | 7773 | 5f5f | 5f5f | 4531 | 3a30 | 2c6c | 6566 | 745f | 5f5f |
| 4237120 | 5f45 | 313a | 312c | 7269 | 6768 | 745f | 5f5f | 5f45 | 313a | 322c | 696e | 7465 | 726e | 616c | 5f5f | 5f5f | 4531 | 3a33 | 2c64 | 6563 | 5f5f | 5f5f | 4531 | 3a34 |
| 4237200 | 2c6f | 6374 | 5f5f | 5f5f | 4531 | 3a35 | 2c68 | 6578 | 5f5f | 5f5f | 4531 | 3a36 | 2c73 | 686f | 7762 | 6173 | 655f | 5f5f | 5f45 | 313a | 372c | 5c00 | 7368 | 6f77 |
| 4237260 | 706f | 696e | 745f | 5f5f | 5f45 | 313a | 382c | 7570 | 7065 | 7263 | 6173 | 655f | 5f5f | 5f45 | 313a | 392c | 7368 | 6f77 | 706f | 735f | 5f5f | 5f45 | 313a | 3130 |
| 4237340 | 2c73 | 6369 | 656e | 7469 | 6669 | 635f | 5f5f | 5f45 | 313a | 3131 | 2c66 | 6978 | 6564 | 5f5f | 5f5f | 4531 | 3a31 | 322c | 756e | 6974 | 6275 | 665f | 5f5f | 5f45 |
| 4237420 | 313a | 3133 | 2c73 | 7464 | 696f | 5f5f | 5f5f | 4531 | 3a31 | 342c | 3b00 | 5f5f | 4532 | 3a54 | 2830 | 2c32 | 3529 | 3d65 | 736b | 6970 | 7069 | 6e67 | 5f5f | 5f5f |
| 4237500 | 4532 | 3a30 | 2c74 | 6965 | 645f | 5f5f | 5f45 | 323a | 312c | 3b00 | 696f | 733a | 5428 | 302c | 3236 | 293d | 7336 | 306e | 7573 | 6572 | 5f5f | 3369 | 6f73 | 3a28 |
| 4237560 | 302c | 3129 | 2c30 | 2c33 | 323b | 785f | 7573 | 6572 | 5f5f | 3369 | 6f73 | 3a28 | 302c | 3330 | 293d | 2a28 | 302c | 3237 | 293d | 7875 | 696f | 735f | 7573 | 6572 |
| 4237640 | 5f75 | 6e69 | 6f6e | 3a2c | 3332 | 2c33 | 323b | 6270 | 5f5f | 3369 | 6f73 | 3a28 | 302c | 3331 | 293d | 2a28 | 302c | 3238 | 293d | 7873 | 7374 | 7265 | 616d | 6275 |
| 4237720 | 663a | 2c36 | 342c | 3332 | 3b73 | 7461 | 7465 | 5f5f | 3369 | 6f73 | 3a28 | 302c | 3129 | 2c39 | 362c | 3332 | 3b69 | 7370 | 6563 | 6961 | 6c5f | 5f33 | 696f | 733a |
| 4240000 | 2830 | 2c31 | 292c | 3132 | 382c | 3332 | 3b6f | 7370 | 6563 | 6961 | 6c5f | 5f33 | 696f | 733a | 2830 | 2c31 | 292c | 3136 | 302c | 3332 | 3b69 | 7366 | 785f | 7370 |
| 4240060 | 6563 | 6961 | 6c5f | 5f33 | 696f | 733a | 2830 | 2c31 | 292c | 3139 | 322c | 3332 | 3b6f | 7366 | 785f | 7370 | 6563 | 6961 | 6c5f | 5f33 | 696f | 733a | 2830 | 2c31 |
| 4240140 | 292c | 3232 | 342c | 3332 | 3b5c | 0064 | 656c | 6275 | 665f | 5f33 | 696f | 733a | 2830 | 2c31 | 292c | 3235 | 362c | 3332 | 3b78 | 5f74 | 6965 | 5f5f | 3369 | 6f73 |
| 4240220 | 3a28 | 302c | 3332 | 293d | 2a28 | 302c | 3239 | 293d | 7873 | 6f73 | 7472 | 6561 | 6d3a | 2c32 | 383a | 2c33 | 323b | 785f | 666c | 6167 | 735f | 5f33 | 696f | 733a |
| 4240300 | 2830 | 2c31 | 292c | 3332 | 302c | 3332 | 3b78 | 5f70 | 7265 | 6369 | 7369 | 6f6e | 5f5f | 3369 | 6f73 | 3a28 | 302c | 3429 | 2c33 | 3532 | 2c31 | 363b | 785f | 6669 |
| 4240360 | 6c6c | 5f5f | 3369 | 6f73 | 3a28 | 302c | 3229 | 2c33 | 3638 | 2c38 | 3b78 | 5f77 | 6964 | 7468 | 5f5f | 3369 | 6f73 | 3a28 | 302c | 3429 | 2c33 | 3834 | 2c31 | 363b |
| 4240440 | 6173 | 7369 | 676e | 5f70 | 7269 | 7661 | 7465 | 5f5f | 3369 | 6f73 | 3a28 | 302c | 3129 | 2c34 | 3136 | 2c33 | 323b | 5f5f | 7670 | 7472 | 5f5f | 3369 | 6f73 | 3a28 |
| 4240520 | 302c | 3333 | 2933 | 2a28 | 302c | 3135 | 292c | 3434 | 382c | 3332 | 3b3b | 0062 | 6173 | 6566 | 6965 | 6c64 | 5f5f | 3369 | 6f73 | 3a47 | 2830 | 2c31 | 2900 | 6164 |
| 4240600 | 6a75 | 7374 | 6669 | 656c | 645f | 5f33 | 696f | 733a | 4728 | 302c | 3129 | 0066 | 6c6f | 6174 | 6669 | 656c | 645f | 5f33 | 696f | 733a | 4728 | 302c | 3129 | 006e |
| 4240660 | 6578 | 7462 | 6974 | 5f5f | 3369 | 6f73 | 3a47 | 2830 | 2c31 | 2900 | 6e65 | 7874 | 776f | 7264 | 5f5f | 3369 | 6f73 | 3a47 | 2830 | 2c31 | 2900 | 7374 | 6469 | 6f66 |
| 4240740 | 6c75 | 7368 | 5f5f | 3369 | 6f73 | 3a47 | 2930 | 2c31 | 3629 | 0069 | 6f73 | 3a5a | 6369 | 6f73 | 3b3b | 5f5f | 6374 | 5f5f | 3369 | 6f73 | 4650 | 3973 | 7472 | 6561 |
| 4241020 | 6d62 | 7566 | 205f | 5f63 | 745f | 5f33 | 696f | 7346 | 7620 | 5f5f | 6374 | 5f5f | 3369 | 6f73 | 4652 | 3369 | 6f73 | 205f | 5f64 | 745f | 5f33 | 696f | 7346 | 7620 |
| 4241100 | 666c | 6167 | 735f | 5f33 | 696f | 7346 | 7620 | 666c | 6167 | 735f | 5f33 | 696f | 7346 | 6c20 | 7365 | 7466 | 5f5f | 3369 | 6f73 | 466c | 5431 | 2073 | 6574 | 665f |
| 4241160 | 5f33 | 696f | 7346 | 6c20 | 756e | 7365 | 7466 | 5f5f | 3369 | 6f73 | 466c | 2077 | 6964 | 7468 | 5f5f | 3369 | 6f73 | 4676 | 2077 | 6964 | 7468 | 5f5f | 3369 | 6f73 |
| 4241240 | 4669 | 2074 | 6965 | 5f5f | 3369 | 6f73 | 4650 | 376f | 7374 | 7265 | 616d | 205c | 0074 | 6965 | 5f5f | 3369 | 6f73 | 4676 | 2066 | 696c | 6c5f | 5f33 | 696f | 7346 |
| 4241320 | 6320 | 6669 | 6c6c | 5f5f | 3369 | 6f73 | 4676 | 2070 | 7265 | 6369 | 7369 | 6f6e | 5f5f | 3369 | 6f73 | 4669 | 2070 | 7265 | 6369 | 7369 | 6f6e | 5f5f | 3369 | 6f73 |
| 4241400 | 4676 | 2072 | 6473 | 7461 | 7465 | 5f5f | 3369 | 6f73 | 4676 | 205f | 5f6f | 7050 | 765f | 5f33 | 696f | 7346 | 7620 | 5f5f | 6e74 | 5f5f | 3369 | 6f73 | 4676 | 2065 |
| 4241460 | 6f66 | 5f5f | 3369 | 6f73 | 4676 | 2066 | 6169 | 6c5f | 5f33 | 696f | 7346 | 7620 | 6261 | 645f | 5f33 | 696f | 7346 | 7620 | 676f | 6f64 | 5f5f | 3369 | 6f73 | 4676 |
| 4241540 | 2063 | 6c65 | 6172 | 5f5f | 3369 | 6f73 | 4669 | 2072 | 6462 | 7566 | 5f5f | 3369 | 6f73 | 4676 | 205c | 0069 | 776f | 7264 | 5f5f | 3369 | 6f73 | 4669 | 2070 | 776f |
| 4241620 | 7264 | 5f5f | 3369 | 6f73 | 4669 | 2062 | 6974 | 616c | 6c6f | 635f | 5f33 | 696f | 7353 | 4676 | 2078 | 616c | 6c6f | 635f | 5f33 | 696f | 7353 | 4676 | 2075 | 7265 |
| 4241700 | 7369 | 7a65 | 5f5f | 3369 | 6f73 | 4669 | 2073 | 796e | 635f | 7769 | 7468 | 5f73 | 7464 | 696f | 5f5f | 3369 | 6f73 | 5346 | 7620 | 7365 | 7473 | 7461 | 7465 | 5f5f |
| 4241760 | 3369 | 6f73 | 4669 | 2069 | 6e69 | 745f | 5f33 | 696f | 7346 | 5039 | 7374 | 7265 | 616d | 6275 | 6620 | 5f5f | 6173 | 5f5f | 3369 | 6f73 | 4652 | 3369 | 6f73 | 2073 |
| 4242040 | 6b69 | 705f | 5f33 | 696f | 7346 | 6920 | 3b62 | 6173 | 6566 | 6965 | 6c64 | 5f5f | 3369 | 6f73 | 205c | 0061 | 646a | 7573 | 7466 | 6965 | 6c64 | 5f5f | 3369 | 6f73 |
| 4242120 | 2066 | 6c6f | 6174 | 6669 | 656c | 645f | 5f33 | 696f | 7320 | 6e65 | 7874 | 6269 | 745f | 5f33 | 696f | 7320 | 6e65 | 7874 | 776f | 7264 | 5f5f | 3369 | 6f73 | 2073 |
| 4242200 | 7464 | 696f | 666c | 7573 | 685f | 5f33 | 696f | 7320 | 3b3b | 0073 | 7472 | 6561 | 6d62 | 7566 | 3a54 | 2830 | 2c32 | 3829 | 3d73 | 3430 | 616c | 6c6f | 635f | 5f39 |
| 4242260 | 7374 | 7265 | 616d | 6275 | 663a | 2830 | 2c34 | 292c | 302c | 3136 | 3b78 | 5f75 | 6e62 | 7566 | 5f5f | 3973 | 7472 | 6561 | 6d62 | 7566 | 3a28 | 302c | 3429 | 2c31 |
| 4242340 | 362c | 3136 | 3b78 | 5f62 | 6173 | 655f | 5f39 | 7374 | 7265 | 616d | 6275 | 663a | 2830 | 2c32 | 3029 | 2c33 | 322c | 3332 | 3b78 | 5f70 | 6261 | 7365 | 5f5f | 3973 |
| 4242420 | 7472 | 6561 | 6d62 | 7566 | 3a28 | 302c | 3230 | 292c | 3634 | 2c33 | 323b | 785f | 7070 | 7472 | 5f5f | 3973 | 7472 | 6561 | 6d62 | 7566 | 3a28 | 302c | 3230 | 292c |
| 4242500 | 3936 | 2c33 | 323b | 795f | 6570 | 7074 | 725f | 5f39 | 7374 | 7265 | 616d | 6275 | 663a | 2830 | 2c32 | 3029 | 2c31 | 3238 | 2c33 | 323b | 785f | 6770 | 7472 | 5f5f |
| 4242560 | 3973 | 7472 | 6561 | 6d62 | 7566 | 3a28 | 302c | 3230 | 292c | 3135 | 302c | 3332 | 3b78 | 5f65 | 6770 | 7472 | 5f5f | 3973 | 7472 | 6561 | 6d62 | 7566 | 3a28 | 302c |
| 4242640 | 3230 | 292c | 3139 | 322c | 3332 | 3b5c | 0078 | 5f65 | 6261 | 636b | 5f5f | 3973 | 7472 | 6561 | 6d62 | 7566 | 3a28 | 302c | 3230 | 292c | 3232 | 342c | 3332 | 3b78 |
| 4242720 | 5f62 | 6c65 | 6e5f | 5f39 | 7374 | 7265 | 616d | 6275 | 663a | 2830 | 2c31 | 292c | 3235 | 362c | 3332 | 3b5f | 5f76 | 7074 | 725f | 5f39 | 7374 | 7265 | 616d | 6275 |
| 4243000 | 663a | 2830 | 2c33 | 3329 | 2c32 | 3838 | 2c33 | 323b | [illegible] | 7374 | 7265 | 616d | 6275 | 663a | 5a63 | 7374 | 7265 | 616d | 6275 | 663b | 3b5f | 5f63 | 745f | 5f39 |
| 4243060 | 7374 | 7265 | 616d | 6275 | 6646 | 5239 | 7374 | 7265 | 616d | 6275 | 6620 | 5f5f | 6374 | 5f5f | 3973 | 7472 | 6561 | 6d62 | 7566 | 4676 | 205f | 5f63 | 745f | 5f39 |
| 4243140 | 7374 | 7265 | 616d | 6275 | 6646 | 5063 | 6920 | 5f5f | 6374 | 5f5f | 3973 | 7472 | 6561 | 6d62 | 7566 | 4650 | 6369 | 5432 | 205f | 5f61 | 735f | 5f39 | 7374 | 7265 |
| 4243220 | 616d | 6275 | 6646 | 5239 | 7374 | 7265 | 616d | 6275 | 6620 | 6462 | 705f | 5f39 | 7374 | 7265 | 616d | 6275 | 6646 | 7620 | 6261 | 7365 | 5f5f | 3973 | 7472 | 6561 |
| 4243300 | 6d62 | 7566 | 4676 | 2070 | 6261 | 7365 | 5f5f | 3973 | 7472 | 6561 | 6d62 | 7566 | 4676 | 205c | 0070 | 7074 | 725f | 5f39 | 7374 | 7265 | 616d | 6275 | 6646 | 7620 |
| 4243360 | 6570 | 7074 | 725f | 5f39 | 7374 | 7265 | 616d | 6275 | 6646 | 7620 | 6770 | 7472 | 5f5f | 3973 | 7472 | 6561 | 6d62 | 7566 | 4676 | 2065 | 6770 | 7472 | 5f5f | 3973 |
| 4243440 | 7472 | 6561 | 6d62 | 7566 | 4676 | 2065 | 6261 | 636b | 5f5f | 3973 | 7472 | 6561 | 6d62 | 7566 | 4676 | 2065 | 6275 | 665f | 5f39 | 7374 | 7265 | 616d | 6275 | 6646 |
| 4243520 | 7620 | 626c | 656e | 5f5f | 3973 | 7472 | 6561 | 6d62 | 7566 | 4676 | 2073 | 6574 | 705f | 5f39 | 7374 | 7265 | 616d | 6275 | 6646 | 5063 | 5431 | 2073 | 6574 | 675f |
| 4243600 | 5f39 | 7374 | 7265 | 616d | 6275 | 6646 | 5063 | 4e32 | 3120 | 7062 | 756d | 705f | 5f39 | 7374 | 7265 | 616d | 6275 | 6646 | 6920 | 5c00 | 6762 | 756d | 705f | 5f39 |
| 4243660 | 7374 | 7265 | 616d | 6275 | 6646 | 6920 | 7365 | 7462 | 5f5f | 3973 | 7472 | 6561 | 6d62 | 7566 | 4650 | 6354 | 3169 | 2075 | 6e62 | 7566 | 6665 | 7265 | 645f | 5f39 |

```
4243740  7374 7265 616d 6275 6646 7620 756e 6275 6666 6572 6564 5f5f 3973 7472 6561 6d62 7566 4669 2061 6c6c 6f63 6174 655f 5f39
4244020  7374 7265 616d 6275 6646 7620 646f 616c 6c6f 6361 7465 5f5f 3973 7472 6561 6d62 7566 4676 206f 7665 7266 6c6f 775f 5f39
4244100  7374 7265 616d 6275 6646 6920 756e 6465 7266 6c6f 775f 5f39 7374 7265 616d 6275 6646 7620 5c00 7062 6163 6b66 6169 6c5f
4244160  5f39 7374 7265 616d 6275 6646 6920 7379 6e63 5f5f 3973 7472 6561 6d62 7566 4676 2073 6565 6b6f 6666 5f5f 3973 7472 6561
4244240  6d62 7566 466c 3873 6565 6b5f 6469 7269 2073 6565 6b70 6f73 5f5f 3973 7472 6561 6d62 7566 466c 6920 7873 7075 746e 5f5f
4244320  3973 7472 6561 6d62 7566 4650 4363 6920 7873 6765 746e 5f5f 3973 7472 6561 6d62 7566 4650 6369 2069 6e5f 6176 6169 6c5f
4244400  5f39 7374 7265 616d 6275 6646 7620 6f75 745f 7761 6974 696e 675f 5f39 7374 7265 616d 6275 6646 7620 5c00 7367 6574 635f
4244460  5f39 7374 7265 616d 6275 6646 7620 736e 6578 7463 5f5f 3973 7472 6561 6d62 7566 4676 2073 6275 6d70 635f 5f39 7374 7265
4244540  616d 6275 6646 7620 7374 6f73 7363 5f5f 3973 7472 6561 6d62 7566 4676 2073 7075 7462 6163 6b63 5f5f 3973 7472 6561 6d62
4244620  7566 4663 2073 7075 7463 5f5f 3973 7472 6561 6d62 7566 4669 2073 7075 746e 5f5f 3973 7472 6561 6d62 7566 4650 4363 6920
4244700  7367 6574 6e5f 5f39 7374 7265 616d 6275 6646 5063 6920 7365 7462 7566 5f5f 3973 7472 6561 6d62 7566 4650 6369 205c 0073
4244760  6574 6275 665f 5f39 7374 7265 616d 6275 6646 5055 6369 2073 6574 6275 665f 5f39 7374 7265 616d 6275 6646 5063 6954 3220
4245040  5f5f 6474 5f5f 3973 7472 6561 6d62 7566 4676 2078 5f73 6e65 7874 635f 5f39 7374 7265 616d 6275 6646 7620 3b3b 3b00 6973
4245120  7472 6561 6d3a 5428 302c 3334 293d 7337 3278 5f67 636f 756e 745f 5f37 6973 7472 6561 6d3a 2830 2c31 292c 302c 3332 3b5f
4245200  5f76 7074 725f 5f37 6973 7472 6561 6d3a 2830 2c33 3329 2c33 322c 3332 3b50 696f 733a 2830 2c33 3529 3d2a 2830 2c32 3629
4245260  2c36 342c 3332 3b4f 696f 733a 2830 2c32 3629 2c39 362c 3438 303b 3b00 6973 7472 6561 6d3a 5a63 6973 7472 6561 6d3b 696f
4245340  733b 5f5f 6374 5f5f 3769 7374 7265 616d 4650 3973 7472 6561 6d62 7566 205f 5f63 745f 5f37 6973 7472 6561 6d46 7620 5f5f
4245420  6374 5f5f 3769 7374 7265 616d 4650 3973 7472 6561 6d62 7566 6950 376f 7374 7265 616d 205f 5f63 745f 5f37 6973 7472 6561
4245500  6d46 6950 6354 3120 5f5f 6374 5f5f 3769 7374 7265 616d 4669 5431 5037 6f73 7472 6561 6d20 5f5f 6374 5f5f 3769 7374 7265
4245560  616d 4652 3769 7374 7265 616d 205f 5f64 745f 5f37 6973 7472 6561 6d46 7620 5c00 6970 6678 5f5f 3769 7374 7265 616d 4669
4245640  2069 7366 785f 5f37 6973 7472 6561 6d46 7620 7365 656b 675f 5f37 6973 7472 6561 6d46 6c20 7365 656b 675f 5f37 6973 7472
4245720  6561 6d46 6c38 7365 656b 5f64 6972 2074 656c 6c67 5f5f 3769 7374 7265 616d 4676 205f 5f72 735f 5f37 6973 7472 6561 6d46
4246000  5046 5237 6973 7472 6561 6d5f 5237 6973 7472 6561 6d20 5f5f 7273 5f5f 3769 7374 7265 616d 4650 4652 3369 6f73 5f52 3369
4246060  6f73 205f 5f72 735f 5f37 6973 7472 6561 6d46 5063 205f 5f72 735f 5f37 6973 7472 6561 6d46 5055 6320 5c00 5f5f 7273 5f5f
4246140  3769 7374 7265 616d 4652 5563 205f 5f72 735f 5f37 6973 7472 6561 6d46 5263 205f 5f72 735f 5f37 6973 7472 6561 6d46 5273
4246220  205f 5f72 735f 5f37 6973 7472 6561 6d46 5269 205f 5f72 735f 5f37 6973 7472 6561 6d46 526c 205f 5f72 735f 5f37 6973 7472
4246300  6561 6d46 5255 7320 5f5f 7273 5f5f 3769 7374 7265 616d 4652 5569 205f 5f72 735f 5f37 6973 7472 6561 6d46 5255 6c20 5f5f
4246360  7273 5f5f 3769 7374 7265 616d 4652 6620 5f5f 7273 5f5f 3769 7374 7265 616d 4652 6420 5f5f 7273 5f5f 3769 7374 7265 616d
4246440  4650 3973 7472 6561 6d62 7566 205c 0067 6574 5f5f 3769 7374 7265 616d 4650 6369 6320 6765 745f 5f37 6973 7472 6561 6d46
4246520  5055 6369 6320 6765 745f 5f37 6973 7472 6561 6d46 5239 7374 7265 616d 6275 6663 2067 6574 5f5f 3769 7374 7265 616d 4652
4246600  5563 2067 6574 5f5f 3769 7374 7265 616d 4652 6320 6765 745f 5f37 6973 7472 6561 6d46 7620 6765 746c 696e 655f 5f37 6973
4246660  7472 6561 6d46 5063 6963 2067 6574 6c69 6e65 5f5f 3769 7374 7265 616d 4650 5563 6963 2070 6565 6b5f 5f37 6973 7472 6561
4246740  6d46 7620 6967 6e6f 7265 5f5f 3769 7374 7265 616d 4669 5431 205c 0072 6561 645f 5f37 6973 7472 6561 6d46 5063 6920 7265
4247020  6164 5f5f 3769 7374 7265 616d 4650 5563 6920 6763 6f75 6e74 5f5f 3769 7374 7265 616d 4676 2070 7574 6261 636b 5f5f 3769
4247100  7374 7265 616d 4663 2073 796e 635f 5f37 6973 7472 6561 6d46 7620 646f 5f69 7066 785f 5f37 6973 7472 6561 6d46 6920 6561
4247160  7477 6869 7465 5f5f 3769 7374 7265 616d 4676 2078 6765 745f 5f37 6973 7472 6561 6d46 5063 203b 3b3b 006f 7374 7265 616d
4247240  3a54 2830 2c32 3929 3d73 3638 5f5f 7670 7472 5f5f 376f 7374 7265 616d 3a28 302c 3333 292c 302c 3332 3b50 696f 733a 2830
4247320  2c33 3529 2c33 322c 3332 3b4f 696f 733a 2830 2c32 3629 2c36 342c 3438 303b 3b00 6f73 7472 6561 6d3a 5a63 6f73 7472 6561
4247400  6d3b 696f 733b 5f5f 6374 5f5f 376f 7374 7265 616d 4650 3973 7472 6561 6d62 7566 205f 5f63 745f 5f37 6f73 7472 6561 6d46
4247460  7620 5f5f 6374 5f5f 376f 7374 7265 616d 4669 205f 5f63 745f 5f37 6f73 7472 6561 6d46 6950 6320 5f5f 6374 5f5f 376f 7374
4247540  7265 616d 4652 376f 7374 7265 616d 205f 5f64 745f 5f37 6f73 7472 6561 6d46 7620 6f70 6678 5f5f 376f 7374 7265 616d 4676
4247620  206f 7366 785f 5f37 6f73 7472 6561 6d46 7620 666c 7573 685f 5f37 6f73 7472 6561 6d46 7620 5c00 7365 656b 705f 5f37 6f73
4247700  7472 6561 6d46 6c20 7365 656b 705f 5f37 6f73 7472 6561 6d46 6c38 7365 656b 5f64 6972 2074 656c 6c70 5f5f 376f 7374 7265
4247760  616d 4676 2070 7574 5f5f 376f 7374 7265 616d 4663 205f 5f6c 735f 5f37 6f73 7472 6561 6d46 6320 5f5f 6c73 5f5f 376f 7374
4250040  7265 616d 4655 6320 5f5f 6c73 5f5f 376f 7374 7265 616d 4650 4363 205f 5f6c 735f 5f37 6f73 7472 6561 6d46 6920 5f5f 6c73
4250120  5f5f 376f 7374 7265 616d 466c 205f 5f6c 735f 5f37 6f73 7472 6561 6d46 6420 5f5f 6c73 5f5f 376f 7374 7265 616d 4666 205c
4250200  005f 5f6c 735f 5f37 6f73 7472 6561 6d46 5569 205f 5f6c 735f 5f37 6f73 7472 6561 6d46 556c 205f 5f6c 735f 5f37 6f73 7472
4250260  6561 6d46 5076 205f 5f6c 735f 5f37 6f73 7472 6561 6d46 5039 7374 7265 616d 6275 6620 5f5f 6c73 5f5f 376f 7374 7265 616d
4250340  4673 205f 5f6c 735f 5f37 6f73 7472 6561 6d46 5573 205f 5f6c 735f 5f37 6f73 7472 6561 6d46 5046 5237 6f73 7472 6561 6d5f
4250420  5237 6f73 7472 6561 6d20 5f5f 6c73 5f5f 376f 7374 7265 616d 4650 4652 3369 6f73 5f52 3369 6f73 2077 7269 7465 5f5f 376f
4250500  7374 7265 616d 4650 4363 6920 5c00 7772 6974 655f 5f37 6f73 7472 6561 6d46 5043 5563 6920 646f 5f6f 7066 785f 5f37 6f73
4250560  7472 6561 6d46 7620 646f 5f6f 7366 785f 5f37 6f73 7472 6561 6d46 7620 3b3b 3b00 7075 745f 5f37 6f73 7472 6561 6d46 633a
4250640  6628 302c 3336 293d 2a28 302c 3239 2900 5f5f 3074 6869 733a 7028 302c 3336 2900 5f5f 3063 3a70 2830 2c32 2900 2f75 7372
4250720  2f43 432f 7375 6e34 2f69 6e63 6c2f 696f 7374 7265 616d 2e68 005f 5f30 7468 6973 3a72 2830 2c33 3629 005f 5f30 7468 6973
4251000  203a 5a74 6c00 5f5f 3063 203a 5a74 6c00 7075 745f 5f37 6f73 7472 6561 6d46 6320 3a5a 7446 0069 6f73 7472 6561 6d3a 5428
```

| | | | | | | | | | | | | | | | | | | | | | | | | |
|---|---|---|---|---|---|---|---|---|---|---|---|---|---|---|---|---|---|---|---|---|---|---|---|---|
| 4251060 | 302c | 3337 | 293d | 7338 | 3078 | 5f67 | 636f | 756e | 745f | 5f37 | 6973 | 7472 | 6561 | 6d3a | 2830 | 2c31 | 292c | 302c | 3332 | 3b5f | 5f76 | 7074 | 725f | 5f37 |
| 4251140 | 6973 | 7472 | 6561 | 6d3a | 2830 | 2c33 | 3329 | 2c33 | 322c | 3332 | 3b50 | 696f | 733a | 2830 | 2c33 | 3529 | 2c36 | 342c | 3332 | 3b4f | 6f73 | 7472 | 6561 | 6d3a |
| 4251220 | 2830 | 2c32 | 3929 | 2c39 | 362c | 3534 | 343b | 3b00 | 696f | 7374 | 7265 | 616d | 3a5a | 6369 | 6f73 | 7472 | 6561 | 6d3b | 6973 | 7472 | 6561 | 6d20 | 6f73 | 7472 |
| 4251300 | 6561 | 6d20 | 696f | 733b | 5f5f | 6374 | 5f5f | 3869 | 6f73 | 7472 | 6561 | 6d46 | 5039 | 7374 | 7265 | 616d | 6275 | 6620 | 5f5f | 6374 | 5f5f | 3869 | 6f73 | 7472 |
| 4251360 | 6561 | 6d46 | 7620 | 5f5f | 6374 | 5f5f | 3869 | 6f73 | 7472 | 6561 | 6d46 | 5238 | 696f | 7374 | 7265 | 616d | 205f | 5f64 | 745f | 5f38 | 696f | 7374 | 7265 | 616d |
| 4251440 | 4676 | 203b | 3b3b | 0063 | 696e | 3a47 | 2830 | 2c33 | 3829 | 3d78 | 7369 | 7374 | 7265 | 616d | 5f77 | 6974 | 6861 | 7373 | 6967 | 6e3a | 0063 | 6f75 | 743a | 4728 |
| 4251520 | 302c | 3339 | 293d | 7873 | 6f73 | 7472 | 6561 | 6d5f | 7769 | 7468 | 6173 | 7369 | 676e | 3a00 | 6365 | 7272 | 3a47 | 2830 | 2c33 | 3929 | 0063 | 6c6f | 673a | 4728 |
| 4251600 | 302c | 3339 | 2900 | 496f | 7374 | 7265 | 616d | 5f69 | 6e69 | 743a | 5428 | 302c | 3430 | 2933 | 7331 | 5f5f | 5739 | 5f5f | 3133 | 496f | 7374 | 7265 | 616d | 5f69 |
| 4251660 | 6e69 | 743a | 2830 | 2c32 | 292c | 302c | 383b | 3b00 | 7374 | 6473 | 7461 | 7475 | 735f | 5f31 | 3349 | 6f73 | 7472 | 6561 | 6d5f | 696e | 6974 | 3a47 | 2830 | 2c31 |
| 4251740 | 2900 | 696e | 6974 | 636f | 756e | 745f | 5f31 | 3349 | 6f73 | 7472 | 6561 | 6d5f | 696e | 6974 | 3a47 | 2830 | 2c31 | 2900 | 496f | 7374 | 7265 | 616d | 5f69 | 6e69 |
| 4252020 | 743a | 5a63 | 496f | 7374 | 7265 | 616d | 5f69 | 6e69 | 743b | 3b5f | 5f63 | 745f | 5f31 | 3349 | 6f73 | 7472 | 6561 | 6d5f | 696e | 6974 | 4676 | 205f | 5f64 | 745f |
| 4252100 | 5f31 | 3349 | 6f73 | 7472 | 6561 | 6d5f | 696e | 6974 | 4676 | 203b | 7374 | 6473 | 7461 | 7475 | 735f | 5f31 | 3349 | 6f73 | 7472 | 6561 | 6d5f | 696e | 6974 | 2069 |
| 4252160 | 6e69 | 7463 | 6f75 | 6e74 | 5f5f | 3133 | 496f | 7374 | 7265 | 616d | 5f69 | 6e69 | 7420 | 3b40 | 696f | 733b | 0069 | 6f73 | 7472 | 6561 | 6d5f | 696e | 6974 | 3a53 |
| 4252240 | 2830 | 2c34 | 3029 | 0047 | 5054 | 3a74 | 2830 | 2c31 | 3329 | 0073 | 6d61 | 6e69 | 705f | 696e | 743a | 5428 | 302c | 3431 | 293d | 7338 | 6663 | 745f | 5f31 | 3073 |
| 4252320 | 6d61 | 6e69 | 705f | 696e | 743a | 2830 | 2c34 | 3229 | 3d2a | 2830 | 2c34 | 3329 | 3d66 | 2830 | 2c33 | 3529 | 2c30 | 2c33 | 323b | 6172 | 675f | 5f31 | 3073 | 6d61 |
| 4252400 | 6e69 | 705f | 696e | 743a | 2830 | 2c31 | 292c | 3332 | 2c33 | 323b | 3b00 | 736d | 616e | 6970 | 5f69 | 6e74 | 3a5a | 6373 | 6d61 | 6e69 | 705f | 696e | 743b | 3b5f |
| 4252460 | 5f63 | 745f | 5f31 | 3073 | 6d61 | 6e69 | 705f | 696e | 7446 | 5046 | 5233 | 696f | 7369 | 5f52 | 3369 | 6f73 | 6920 | 3b3b | 5f5f | 6c73 | 5f5f | 4652 | 376f | 7374 |
| 4252540 | 7265 | 616d | 5231 | 3073 | 6d61 | 6e69 | 705f | 696e | 7420 | 5f5f | 7273 | 5f5f | 4652 | 3769 | 7374 | 7265 | 616d | 5231 | 3073 | 6d61 | 6e69 | 705f | 696e | 7420 |
| 4252620 | 3b00 | 7361 | 7070 | 6c79 | 5f69 | 6e74 | 3a54 | 2830 | 2c34 | 3429 | 3d73 | 3466 | 6374 | 5f5f | 3130 | 7361 | 7070 | 6c79 | 5f69 | 6e74 | 3a28 | 302c | 3432 | 292c |
| 4252700 | 302c | 3332 | 3b3b | 0073 | 6170 | 706c | 795f | 696e | 743a | 5a63 | 7361 | 7070 | 6c79 | 5f69 | 6e74 | 3b3b | 5f5f | 6374 | 5f5f | 3130 | 7361 | 7070 | 6c79 | 5f69 |
| 4252760 | 6e74 | 4650 | 4652 | 3369 | 6f73 | 695f | 5233 | 696f | 7320 | 5f5f | 636c | 5f5f | 3130 | 7361 | 7070 | 6c79 | 5f69 | 6e74 | 4669 | 203b | 3b3b | 0069 | 6d61 | 6e69 |
| 4253040 | 735f | 696e | 743a | 5428 | 302c | 3435 | 293d | 7338 | 6663 | 745f | 5f31 | 3069 | 6d61 | 6e63 | 705f | 696e | 743a | 2830 | 2c34 | 3629 | 3d2a | 2830 | 2c34 | 3729 |
| 4253120 | 3d66 | 2830 | 2c34 | 3829 | 3d2a | 2830 | 2c33 | 3429 | 2c30 | 2c33 | 323b | 6172 | 675f | 5f31 | 3069 | 6d61 | 6e69 | 705f | 696e | 743a | 2830 | 2c31 | 292c | 3332 |
| 4253200 | 2c33 | 323b | 3b00 | 696d | 616e | 6970 | 5f69 | 6e74 | 3a5a | 6369 | 6d61 | 6e69 | 705f | 696e | 743b | 3b5f | 5f63 | 745f | 5f31 | 3069 | 6d61 | 6e69 | 705f | 696e |
| 4253260 | 7446 | 5046 | 5237 | 6973 | 7472 | 6561 | 6d69 | 5f52 | 3759 | 7374 | 7265 | 616d | 6920 | 3b3b | 5f5f | 7273 | 5f5f | 4652 | 3769 | 7374 | 7265 | 616d | 5231 | 3069 |
| 4253340 | 6d61 | 6e69 | 705f | 696e | 7420 | 3b00 | 6961 | 7070 | 6c79 | 5f69 | 6e74 | 3a54 | 2830 | 2c34 | 3929 | 3d73 | 3466 | 6374 | 5f5f | 3130 | 6961 | 7070 | 6c79 | 5f69 |
| 4253420 | 6e74 | 3a28 | 302c | 3436 | 292c | 302c | 3332 | 3b3b | 0069 | 6170 | 706c | 795f | 696e | 743a | 5a63 | 6961 | 7070 | 6c79 | 5f69 | 6e74 | 3b3b | 5f5f | 6374 | 5f5f |
| 4253500 | 3130 | 6961 | 7070 | 6c79 | 5f69 | 6e74 | 4550 | 4652 | 3769 | 7374 | 7265 | 616d | 695f | 5237 | 6973 | 7472 | 6561 | 6d20 | 5f5f | 636c | 5f5f | 3130 | 6961 | 7070 |
| 4253560 | 6c79 | 5f69 | 6e74 | 4669 | 203b | 3b3b | 006f | 6d61 | 6e69 | 705f | 696e | 743a | 5428 | 302c | 3530 | 293d | 7338 | 6663 | 745f | 5f31 | 306f | 6d61 | 6e69 | 705f |
| 4253640 | 696e | 743a | 2830 | 2c35 | 3129 | 3d2a | 2830 | 2c35 | 3229 | 3d66 | 2930 | 2c33 | 3629 | 2c30 | 2c33 | 323b | 6172 | 675f | 5f31 | 306f | 6d61 | 6e69 | 705f | 696e |
| 4253720 | 743a | 2830 | 2c31 | 292c | 3332 | 2c33 | 323b | 3b00 | 6f6d | 616e | 6970 | 5f69 | 6e74 | 3a5a | 636f | 6d61 | 6e69 | 705f | 696e | 743b | 3b5f | 5f63 | 745f | 5f31 |
| 4254000 | 306f | 6d61 | 6e69 | 705f | 696e | 7446 | 5046 | 5237 | 6f73 | 7472 | 6561 | 6d69 | 5f52 | 376f | 7374 | 7265 | 616d | 6920 | 3b3b | 5f5f | 6c73 | 5f5f | 4652 | 376f |
| 4254060 | 7374 | 7265 | 616d | 5231 | 306f | 6d61 | 6e69 | 705f | 696e | 7420 | 3b00 | 6f61 | 7070 | 6c79 | 5f69 | 6e74 | 3a54 | 2830 | 2c35 | 3329 | 3d73 | 3466 | 6374 | 5f5f |
| 4254140 | 3130 | 6f61 | 7070 | 6c79 | 5f69 | 6e74 | 3a28 | 302c | 3531 | 292c | 302c | 3332 | 3b3b | 006f | 6170 | 706c | 795f | 696e | 743a | 5a63 | 6f61 | 7070 | 6c79 | 5f69 |
| 4254220 | 6e74 | 3b3b | 5f5f | 6374 | 5f5f | 3130 | 6f61 | 7070 | 6c79 | 5f69 | 6e74 | 4650 | 4652 | 376f | 7374 | 7265 | 616d | 695f | 5237 | 6f73 | 7472 | 6561 | 6d20 | 5f5f |
| 4254300 | 636c | 5f5f | 3130 | 6f61 | 7070 | 6c79 | 5f69 | 6e74 | 4669 | 203b | 3b3b | 0069 | 6f6d | 616e | 6970 | 5f69 | 6e74 | 3a54 | 2830 | 2c35 | 3429 | 3d73 | 3866 | 6374 |
| 4254360 | 5f5f | 3131 | 696f | 6d61 | 6e69 | 705f | 696e | 743a | 2830 | 2c35 | 3529 | 3d2a | 2930 | 2c35 | 3629 | 3d66 | 2830 | 2c35 | 3729 | 3d2a | 2830 | 2c33 | 3729 | 2c30 |
| 4254440 | 2c33 | 323b | 6172 | 675f | 5f31 | 3169 | 6f6d | 616e | 6970 | 5f69 | 6e74 | 3a28 | 302c | 3129 | 2c33 | 322c | 3332 | 3b3b | 0069 | 6f6d | 616e | 6970 | 5f69 | 6e74 |
| 4254520 | 3a5a | 6369 | 6f6d | 616e | 6970 | 5f69 | 6e74 | 3b3b | 5f5f | 6374 | 5f5f | 3131 | 696f | 6d61 | 6e69 | 705f | 696e | 7446 | 5046 | 5238 | 696f | 7374 | 7265 | 616d |
| 4254600 | 695f | 5238 | 696f | 7374 | 7265 | 6161 | 6920 | 3b3b | 5f5f | 6c73 | 5f5f | 4652 | 3869 | 6f73 | 7472 | 6561 | 6d52 | 3131 | 696f | 6d61 | 6e69 | 705f | 696e | 7420 |
| 4254660 | 5f5f | 7273 | 5f5f | 4652 | 3869 | 6f73 | 7472 | 6561 | 6d52 | 3131 | 696f | 6d61 | 6e69 | 705f | 696e | 7420 | 3b00 | 696f | 6170 | 706c | 795f | 696e | 743a | 5428 |
| 4254740 | 302c | 3538 | 293d | 7334 | 6663 | 745f | 5f31 | 3169 | 6f61 | 7070 | 6c79 | 5f69 | 6e74 | 3a28 | 302c | 3535 | 292c | 302c | 3332 | 3b3b | 0069 | 6f61 | 7070 | 6c79 |
| 4255020 | 5f69 | 6e74 | 3a5a | 6369 | 6f61 | 7070 | 6c79 | 5f69 | 6e74 | 3b3b | 5f5f | 6374 | 5f5f | 3131 | 696f | 6170 | 706c | 795f | 696e | 7446 | 5046 | 5238 | 696f | 7374 |
| 4255100 | 7265 | 616d | 695f | 5238 | 696f | 7374 | 7265 | 616d | 205f | 5f63 | 6c5f | 5f31 | 3169 | 6f61 | 7070 | 6c79 | 5f69 | 6e74 | 4669 | 203b | 3b3b | 0073 | 6d61 | 6e69 |
| 4255160 | 705f | 6c6f | 6e67 | 3a54 | 2830 | 2c35 | 3929 | 3d73 | 3866 | 6374 | 5f5f | 3131 | 736d | 616e | 6970 | 5f6c | 6f6e | 673a | 2830 | 2c34 | 3229 | 2c30 | 2c33 | 323b |
| 4255240 | 6172 | 675f | 5f31 | 3173 | 6d61 | 6e69 | 705f | 6c6f | 6e67 | 3a28 | 302c | 3129 | 2c33 | 322c | 3332 | 3b3b | 0073 | 6d61 | 6e69 | 705f | 6c6f | 6e67 | 3a5a | 6373 |
| 4255320 | 6d61 | 6e69 | 705f | 6c6f | 6e67 | 3b3b | 5f5f | 6374 | 5f5f | 3131 | 736d | 616e | 6970 | 5f6c | 6f6e | 6746 | 5046 | 5233 | 696f | 736c | 5f52 | 3369 | 6f73 | 6c20 |
| 4255400 | 3b3b | 5f5f | 6c73 | 5f5f | 4652 | 376f | 7374 | 7265 | 6161 | 5231 | 3173 | 6d61 | 6e69 | 705f | 6c6f | 6e67 | 205f | 5f72 | 735f | 5f46 | 5237 | 6973 | 7472 | 6561 |
| 4255460 | 6d52 | 3131 | 736d | 616e | 6970 | 5f6c | 6f6e | 6720 | 3b00 | 7361 | 7070 | 6c79 | 5f6c | 6f6e | 673a | 5428 | 302c | 3630 | 293d | 7334 | 6663 | 745f | 5f31 | 3173 |
| 4255540 | 6170 | 706c | 795f | 6c6f | 6e67 | 3a28 | 302c | 3432 | 292c | 302c | 3332 | 3b3b | 0073 | 6170 | 706c | 795f | 6c6f | 6e67 | 3a5a | 6373 | 6170 | 706c | 795f | 6c6f |
| 4255620 | 6e67 | 3b3b | 5f5f | 6374 | 5f5f | 3131 | 7361 | 7070 | 6c79 | 5f6c | 6f6e | 6746 | 5046 | 5233 | 696f | 736c | 5f52 | 3369 | 6f73 | 205f | 5f63 | 6c5f | 5f31 | 3173 |
| 4255700 | 6170 | 706c | 795f | 6c6f | 6e67 | 466c | 203b | 3b3b | 0069 | 6161 | 6e69 | 705f | 6c6f | 6e67 | 3a54 | 2830 | 2c36 | 3129 | 3d73 | 3866 | 6374 | 5f5f | 3131 | 696d |
| 4255760 | 616e | 6970 | 5f6c | 6f6e | 673a | 2830 | 2c34 | 3629 | 2c30 | 2c33 | 323b | 6172 | 675f | 5f31 | 3169 | 6d61 | 6e69 | 705f | 6c6f | 6e67 | 3a28 | 302c | 3129 | 2c33 |
| 4256040 | 322c | 3332 | 3b3b | 0069 | 6d61 | 6e69 | 705f | 6c6f | 6e67 | 3a5a | 6369 | 6d61 | 6e69 | 705f | 6c6f | 6e67 | 3b3b | 5f5f | 6374 | 5f5f | 3131 | 696d | 616e | 6970 |
| 4256120 | 5f6c | 6f6e | 6746 | 5046 | 5237 | 6973 | 7472 | 6561 | 6d6c | 5f52 | 3769 | 7374 | 7265 | 616d | 6c20 | 3b3b | 5f5f | 7273 | 5f5f | 4652 | 3769 | 7374 | 7265 | 616d |

```
4256200  5231 3169 6d61 6e69 705f 6c6f 6e67 203b 0069 6170 706c 795f 6c6f 6e67 3a54 2830 2c36 3229 3d73 3466 6374 5f5f 3131 6961
4256260  7070 6c79 5f6c 6f6e 673a 2830 2c34 3629 2c30 2c33 323b 3b00 6961 7070 6c79 5f6c 6f6e 673a 5a63 6961 7070 6c79 5f6c 6f6e
4256340  673b 3b5f 5f63 745f 5f31 3169 6170 706c 795f 6c6f 6e67 4650 4652 3769 7374 7265 616d 6c5f 5237 6973 7472 6561 6d20 5f5f
4256420  636c 5f5f 3131 6961 7070 6c79 5f6c 6f6e 6746 6c20 3b3b 3b00 6f6d 616e 6970 5f6c 6f6e 673a 5428 302c 3633 293d 7338 6663
4256500  745f 5f31 316f 6d61 6e69 705f 6c6f 6e67 3a28 302c 3531 292c 302c 3332 3b61 7267 5f5f 3131 6f6d 616e 6970 5f6c 6f6e 673a
4256560  2830 2c31 292c 3332 2c33 323b 3b00 6f6d 616e 6970 5f6c 6f6e 673a 5a63 6f6d 616e 6970 5f6c 6f6e 673b 3b5f 5f63 745f 5f31
4256640  316f 6d61 6e69 705f 6c6f 6e67 4650 4652 376f 7374 7265 6164 6c5f 5237 6f73 7472 6561 6d6c 203b 3b5f 5f6c 735f 5f46 5237
4256720  6f73 7472 6561 6d52 3131 6f6d 616e 6970 5f6c 6f6e 6720 3b00 6f61 7070 6c79 5f6c 6f6e 673a 5428 302c 3634 293d 7334 6663
4257000  745f 5f31 316f 6170 706c 795f 6c6f 6e67 3a28 302c 3531 292c 302c 3332 3b3b 006f 6170 706c 795f 6c6f 6e67 3a5a 636f 6170
4257060  706c 795f 6c6f 6e67 3b3b 5f5f 6374 5f5f 3131 6f61 7070 6c79 5f6c 6f6e 6746 5046 5237 6f73 7472 6561 6d6c 5f52 376f 7374
4257140  7265 616d 205f 5f63 6c5f 5f31 316f 6170 706c 795f 6c6f 6e67 466c 203b 3b3b 0069 6f6d 616e 6970 5f6c 6f6e 673a 5428 302c
4257220  3635 293d 7338 6663 745f 5f31 3269 6f6d 616e 6970 5f6c 6f6e 673a 2830 2c35 3529 2c30 2c33 323b 6172 675f 5f31 3269 6f6d
4257300  616e 6970 5f6c 6f6e 673a 2830 2c31 292c 3332 2c33 323b 3b00 696f 6d61 6e69 705f 6c6f 6e67 3a5a 6369 6f6d 616e 6970 5f6c
4257360  6f6e 673b 3b5f 5f63 745f 5f31 3269 6f6d 616e 6970 5f6c 6f6e 6746 5046 5238 696f 7374 7265 616d 6c5f 5238 696f 7374 7265
4257440  616d 6c20 3b3b 5f5f 6c73 5f5f 4652 3869 6f73 7472 6561 6d52 3132 696f 6d61 6e69 705f 6c6f 6e67 205f 5f72 735f 5f46 5238
4257520  696f 7374 7265 616d 5231 3269 6f6d 616e 6970 5f6c 6f6e 6720 3b00 696f 6170 706c 795f 6c6f 6e67 3a54 2830 2c36 3629 3d73
4257600  3466 6374 5f5f 3132 696f 6170 706c 795f 6c6f 6e67 3a28 302c 3535 292c 302c 3332 3b3b 0069 6f61 7070 6c79 5f6c 6f6e 673a
4257660  5a63 696f 6170 706c 795f 6c6f 6e67 3b3b 5f5f 6374 5f5f 3132 696f 6170 706c 795f 6c6f 6e67 4650 4652 3869 6f73 7472 6561
4257740  6d6c 5f52 3869 6f73 7472 6561 6d20 5f5f 636c 5f5f 3132 696f 6170 706c 795f 6c6f 6e67 466c 203b 3b3b 0073 7464 696f 6275
4260020  663a 5428 302c 3637 293d 7335 3261 6c6c 6f63 5f5f 3973 7472 6561 6d62 7566 3a28 302c 3429 2c30 2c31 363b 785f 756e 6275
4260100  665f 5f39 7374 7265 616d 6275 663a 2830 2c34 292c 3136 2c31 363b 785f 6261 7365 5f5f 3973 7472 6561 6d62 7566 3a28 302c
4260160  3230 292c 3332 2c33 323b 785f 7062 6173 655f 5f39 7374 7265 616d 6275 663a 2830 2c32 3029 2c36 342c 3332 3b78 5f70 7074
4260240  725f 5f39 7374 7265 616d 6275 663a 2830 2c32 3029 2c39 362c 3332 3b78 5f65 7070 7472 5f5f 3973 7472 6561 6d62 7566 3a28
4260320  302c 3230 292c 3132 382c 3332 3b78 5f67 7074 725f 5f39 7374 7265 616d 6275 663a 2830 2c32 3029 2c31 3630 2c33 323b 785f
4260400  6567 7074 725f 5f39 7374 7265 616d 6275 663a 2830 2c32 3029 2c31 3932 2c33 323b 5c00 785f 6562 6163 6b5f 5f39 7374 7265
4260460  616d 6275 663a 2830 2c32 3029 2c32 3234 2c33 323b 785f 626c 656e 5f5f 3973 7472 6561 6d62 7566 3a28 302c 3129 2c32 3536
4260540  2c33 323b 5f5f 7670 7472 5f5f 3973 7472 6561 6162 7566 3a28 302c 3333 292c 3238 382c 3332 3b66 705f 5f38 7374 6469 6f62
4260620  7566 3a28 302c 3638 293d 2a28 302c 3138 293d 7873 5f69 6f62 7566 3a2c 3332 302c 3332 3b6c 6173 745f 6f70 5f5f 3873 7464
4260700  696f 6275 663a 2930 2c31 292c 3335 322c 3332 3b62 7566 5f5f 3873 7464 696f 6275 663a 2830 2c36 3929 3d61 7228 302c 3129
4260760  3b30 3b31 3b28 302c 3229 2c33 3834 2c31 363b 3b00 7374 6469 6f62 7566 3a5a 6373 7464 696f 6275 663b 7374 7265 616d 6275
4261040  663b 6f76 6572 666c 6f77 5f5f 3973 7464 696f 6275 6646 6920 756e 6465 7266 6c6f 775f 5f38 7374 6469 6f62 7566 4676 2073
4261120  736e 635f 5f38 7374 6469 6f62 7566 4676 2073 6565 6b6f 6666 5f5f 3873 7464 696f 6275 6646 6c38 7365 656b 5f64 6972 6920
4261200  7062 6163 6b66 6169 6c5f 5f38 7374 6469 6f62 7566 4669 205f 5f63 745f 5f38 7374 6469 6f62 7566 4650 365f 696f 6275 6620
4261260  5f5f 6374 5f5f 3873 7464 696f 6275 6646 5243 3973 7464 696f 6275 6620 5c00 7374 6469 6f66 696c 655f 5f38 7374 6469 6f62
4261340  7566 4676 205f 5f64 745f 5f38 7374 6469 6f62 7566 4676 203b 3b3b 0066 696c 6562 7566 3a54 2830 2c37 3029 3173 3634 616c
4261420  6c6f 635f 5f39 7374 7265 616d 6275 663a 2830 2c34 292c 302c 3136 3b78 5f75 6e62 7566 5f5f 3973 7472 6561 6d62 7566 3a28
4261500  302c 3429 2c31 362c 3136 3b78 5f62 6173 655f 5f39 7374 7265 616d 6275 663a 2830 2c32 3029 2c33 322c 3332 3b78 5f70 6261
4261560  7365 5f5f 3973 7472 6561 6d62 7566 3a28 302c 3230 292c 3634 2c33 323b 785f 7070 7472 5f5f 3973 7472 6561 6d62 7566 3a28
4261640  302c 3230 292c 3936 2c33 323b 785f 6570 7074 725f 5f39 7374 7265 616d 6275 663a 2830 2c32 3029 2c31 3238 2c33 323b 785f
4261720  6770 7472 5f5f 3973 7472 6561 6d62 7566 3a28 302c 3230 292c 3136 302c 3332 3b78 5f65 6770 7472 5f5f 3973 7472 6561 6d62
4262000  7566 3a28 302c 3230 292c 3139 322c 3332 3b5c 0078 5f65 6261 636b 5f5f 3973 7472 6561 6d62 7566 3a28 302c 3230 292c 3232
4262060  342c 3332 3b78 5f62 6c65 6e5f 5f39 7374 7265 616d 6275 663a 2830 2c31 292c 3235 362c 3332 3b5f 5f76 7074 725f 5f39 7374
4262140  7265 616d 6275 663a 2830 2c33 3329 2c32 3838 2c33 323b 7866 645f 5f37 6669 6c65 6275 663a 2830 2c31 292c 3332 302c 3332
4262220  3b6d 6f64 655f 5f37 6669 6c65 6275 663a 2830 2c31 292c 3335 322c 3332 3b6f 7065 6e65 645f 5f37 6669 6c65 6275 663a 2830
4262300  2c32 292c 3338 342c 383b 6c61 7374 5f73 6565 6b5f 5f37 6669 6c65 6275 663a 2830 2c31 292c 3431 362c 3332 3b69 6e5f 7374
4262360  6172 745f 5f37 6669 6c65 6275 663a 2830 2c32 3029 2c34 3438 2c33 323b 6c61 6865 6164 5f5f 3766 696c 6562 7566 3a28 302c
4262440  3639 292c 3438 302c 3136 3b3b 006f 7065 6e70 726f 745f 5f37 6669 6c65 6275 663a 4728 302c 3129 0066 696c 6562 7566 3a5a
4262520  6366 696c 6562 7566 3b73 7472 6561 6d62 7566 3b5f 5f63 745f 5f37 6669 6c65 6275 6646 7620 5f5f 6374 5f5f 3766 696c 6562
4262600  7566 4669 205f 5f63 745f 5f37 6669 6c65 6275 6646 6950 6354 3120 5f5f 6374 5f5f 3766 696c 6562 7566 4652 4337 6669 6c65
4262660  6275 6620 6973 5f6f 7065 6e5f 5f37 6669 6c65 6275 6646 7620 6664 5f5f 3766 696c 6562 7566 4676 206f 7065 6e5f 5f37 6669
4262740  6c65 6275 6646 5043 6369 5432 2061 7474 6163 695f 5f37 6669 6c65 6275 6646 6920 636c 6f73 655f 5f37 6669 6c65 6275 6646
4263020  7620 5c00 5f5f 6474 5f5f 3766 696c 6562 7566 4676 206f 7665 7266 6c6f 775f 5f37 6669 6c65 6275 6646 6920 756e 6465 7266
4263100  6c6f 775f 5f37 6669 6c65 6275 6646 7620 7379 6e63 5f5f 3766 696c 6562 7566 4676 2073 6565 6b6f 6666 5f5f 3766 696c 6562
4263160  7566 466c 3073 6565 6b5f 6469 7269 2073 6574 6275 665f 5f37 6669 6c65 6275 6646 5063 6920 6c61 7374 5f6f 705f 5f37 6669
4263240  6c65 6275 6646 7620 3b6f 7065 6e70 726f 745f 5f37 6669 6c65 6275 6620 3b3b 0066 7374 7265 616d 6261 7365 3a54 2830 2c37
```

```
4263320  3129 3d73 3133 3262 7566 5f5f 3131 6673 7472 6561 6d62 6173 653a 2830 2c37 3029 2c30 2c35 3132 3b5f 5f76 7074 725f 5f31
4263400  3166 7374 7265 616d 6261 7365 3a28 302c 3333 292c 3531 322c 3332 3b50 696f 733a 2830 2c33 3529 2c35 3434 2c33 323b 4f69
4263460  6f73 3a28 302c 3236 292c 3537 362c 3438 303b 3b00 6673 7472 6561 6d62 6173 653a 5a63 6673 7472 6561 6d62 6173 653b 696f
4263540  733b 5f5f 6374 5f5f 3131 6673 7472 6561 6d62 6173 6546 7620 5f5f 6374 5f5f 3131 6673 7472 6561 6d62 6173 6546 5043 6369
4263620  5432 205f 5f63 745f 5f31 3166 7374 7265 616d 6261 7365 4669 205f 5f63 745f 5f31 3166 7374 7265 616d 6261 7365 4669 5063
4263700  5431 205f 5f63 745f 5f31 3166 7374 7265 616d 6261 7365 4652 3131 6673 7472 6561 6d62 6173 6520 5f5f 6474 5f5f 3131 6673
4263760  7472 6561 6d62 6173 6546 7620 6f70 656e 5f5f 3131 6673 7472 6561 6d62 6173 6546 5043 6369 5432 205c 0061 7474 6163 685f
4264040  5f31 3166 7374 7265 616d 6261 7365 4669 2063 6c6f 7365 5f5f 3131 6673 7472 6561 6d62 6173 6546 7620 7365 7462 7566 5f5f
4264120  3131 6673 7472 6561 6d62 6173 6546 5063 6920 7264 6275 665f 5f31 3166 7374 7265 616d 6261 7365 4676 2076 6572 6966 795f
4264200  5f31 3166 7374 7265 616d 6261 7365 4669 203b 3b3b 0073 7461 7465 5f76 616c 7565 3a74 2830 2c32 3129 0056 616c 7565 5f54
4264260  7970 653a 5428 302c 3732 293d 6555 4e4b 4e4f 574e 563a 302c 5354 5249 4e47 3a31 2c49 4e54 4547 4552 3a32 2c46 4c4f 4154
4264340  3a33 2c3b 0042 6c6f 636b 5f54 7970 653a 5428 302c 3733 293d 6555 4e4b 4e4f 574e 423a 302c 454e 5449 5459 3a31 2c46 554e
4264420  4354 494f 4e3a 322c 5052 4f43 4544 5552 453a 332c 3b00 456e 7469 7479 5f54 7970 653a 5428 302c 3734 293d 6555 4e4b 4e4f
4264500  574e 453a 302c 4152 4348 4954 4543 5455 5245 3a31 2c53 5542 5052 4f47 5241 4d3a 322c 3b00 5069 6e5f 5479 7065 3a54 2830
4264560  2c37 3529 3d65 554e 4b4e 4f57 4e50 3a30 2c49 4e50 494e 3a31 2c4f 5554 5049 4e3a 322c 494e 4f55 5450 494e 3a33 2c3b 0050
4264640  6172 615f 436c 6173 733a 5428 302c 3736 293d 6555 4e4b 4e4f 574e 433a 302c 464f 524d 414c 3a31 2c41 4354 5541 4c3a 322c
4264720  5245 534f 4c56 4544 3a33 2c3b 0042 4f4f 4c45 414e 3a54 2830 2c37 3729 3d65 4661 6c73 653a 302c 5472 7565 3a31 2c3b 0042
4265000  6f6f 6c65 616e 3a54 2830 2c37 3829 3d65 6661 6c73 653a 302c 7472 7565 3a31 2c3b 0042 7566 6665 723a 4728 302c 3230 2900
4265060  4f62 6a65 6374 3a54 2830 2c37 3929 3d73 345f 5f76 7074 725f 5f36 4f62 6a65 6374 3a28 302c 3333 292c 302c 3332 3b3b 004f
4265140  626a 6563 743a 5a63 4f62 6a65 6374 3b3b 5f5f 6374 5f5f 364f 626a 6563 7446 7620 5f5f 6374 5f5f 364f 626a 6563 7446 5243
4265220  364f 626a 6563 7420 6572 726f 724d 656d 6f72 795f 5f36 4f62 6a65 6374 4650 6354 3120 6578 706c 6169 6e5f 5f36 4f62 6a65
4265300  6374 4650 6320 696e 4f72 6465 725f 5f36 4f62 6a65 6374 4650 364f 626a 6563 7420 3b3b 3b00 5f5f 7074 626c 5f5f 364f 626a
4265360  6563 745f 5f4d 475f 4d61 6e61 6765 725f 6378 783a 4728 302c 3333 2900 5046 3a74 2830 2c31 3529 0050 4643 3a74 2830 2c31
4265440  3529 0050 4649 3a74 2830 2c31 3529 004e 4f62 6a65 6374 3a54 2830 2c38 3029 3d73 385f 5f76 7074 725f 5f36 4f62 6a65 6374
4265520  3a28 302c 3333 292c 302c 3332 3b6e 616d 655f 5f37 4e4f 626a 6563 743a 2830 2c32 3029 2c33 322c 3332 3b3b 004e 4f62 6a65
4265600  6374 3a5a 634e 4f62 6a65 6374 3b4f 626a 6563 743b 5f5f 6374 5f5f 374e 4f62 6a65 6374 4650 6320 5f5f 6374 5f5f 374e 4f62
4265660  6a65 6374 4652 4337 4e4f 626a 6563 7420 7365 744e 616d 655f 5f37 4e4f 626a 6563 7446 5063 2067 6574 4e61 6d65 5f5f 374e
4265740  4f62 6a65 6374 4676 2065 7870 6c61 696e 5f5f 374e 4f62 6a65 6374 4650 6320 6765 7441 7474 725f 5f37 4e4f 626a 6563 7446
4266020  6920 6765 7450 726f 705f 5f37 4e4f 626a 6563 7446 5063 6920 7365 7450 726f 705f 5f37 4e4f 626a 6563 7446 5063 5431 205c
4266100  0073 6574 5072 6f70 5f5f 374e 4f62 6a65 6374 4650 6369 2073 6574 5072 6f70 5f5f 374e 4f62 6a65 6374 4650 6366 2069 7347
4266160  5445 5f5f 374e 4f62 6a65 6374 4650 364f 626a 6563 7420 6973 4c54 455f 5f37 4e4f 626a 6563 7446 5036 4f62 6a65 6374 203b
4266240  3b3b 006f 7374 7265 616d 5f77 6374 6861 7373 6967 6e3a 5428 302c 3339 293d 7336 385f 5f76 7074 725f 5f37 6f73 7472 6561
4266320  6d3a 2830 2c33 3329 2c30 2c33 323b 5069 6f73 3a28 302c 3335 292c 3332 2c33 323b 4f69 6f73 3a28 302c 3236 292c 3634 2c34
4266400  3830 3b3b 006f 7374 7265 616d 5f77 6974 6861 7373 6967 6e3a 5a63 6f73 7472 6561 6d5f 7769 7468 6173 7369 676e 3b6f 7374
4266460  7265 616d 2069 6f73 3b5f 5f63 745f 5f31 386f 7374 7265 616d 5f77 6974 6861 7373 6967 6e46 7620 5f5f 6374 5f5f 3138 6f73
4266540  7472 6561 6d5f 7769 7468 6173 7369 676e 4652 3138 6f73 7472 6561 6d5f 7769 7468 6173 7369 676e 205f 5f64 745f 5f31 386f
4266620  7374 7265 616d 5f77 6974 6861 7373 6967 6e46 7620 5f5f 6173 5f5f 3138 6f73 7472 6561 6d5f 7769 7468 6173 7369 676e 4652
4266700  376f 7374 7265 616d 205c 005f 5f61 735f 5f31 386f 7374 7265 616d 5f77 6974 6861 7373 6967 6e46 5039 7374 7265 616d 6275
4266760  6620 3b3b 3b00 5046 423a 7428 302c 3135 2900 4c4e 4f62 6a65 6374 3a54 2830 2c38 3129 3d73 3132 5f5f 7670 7472 5f5f 364f
4267040  626a 6563 743a 2830 2c33 3329 2c30 2c33 323b 6e61 6d65 5f5f 374e 4f62 6a65 6374 3a28 302c 3230 292c 3332 2c33 323b 6e65
4267120  7874 5f5f 384c 4e4f 626a 6563 743a 2830 2c38 3229 3d2a 2830 2c38 3129 2c36 342c 3332 3b3b 004c 4e4f 626a 6563 743a 5a63
4267200  4c4e 4f62 6a65 6374 3b4e 4f62 6a65 6374 3b5f 5f63 745f 5f38 4c4e 4f62 6a65 6374 4650 6350 384c 4e4f 626a 6563 7420 5f5f
4267260  6374 5f5f 384c 4e4f 626a 6563 7446 5243 384c 4e4f 626a 6563 7420 7365 744e 6578 745f 5f38 4c4e 4f62 6a65 6374 4650 384c
4267340  4e4f 626a 6563 7420 6765 744e 6578 745f 5f38 4c4e 4f62 6a65 6374 4676 203b 3b3b 004c 4f62 6a65 6374 3a54 2830 2c38 3329
4267420  3d73 395f 5f76 7074 725f 5f36 4f62 6a65 6374 3a28 302c 3333 292c 302c 3332 3b6e 6578 745f 5f37 4c4f 626a 6563 743a 2830
4267500  2c38 3429 3d2a 2830 2c38 3329 2c33 322c 3332 3b3b 004c 4f62 6a65 6374 3a5a 634c 4f62 6a65 6374 3b4f 626a 6563 743b 5f5f
4267560  6374 5f5f 374c 4f62 6a65 6374 4650 374c 4f62 6a65 6374 205f 5f63 745f 5f37 4c4f 626a 6563 7446 5243 374c 4f62 6a65 6374
4267640  2073 6574 4e65 7874 5f5f 374c 4f62 6a65 6374 4650 374c 4f62 6a65 6374 2067 6574 4e65 7874 5f5f 374c 4f62 6a65 6374 4676
4267720  203b 3b3b 004c 504f 626a 6563 743a 5428 302c 3835 293d 7331 325f 5f76 7074 725f 5f36 4f62 6a65 6374 3a28 302c 3333 292c
4270000  302c 3332 3b6e 6578 745f 5f37 4c4f 626a 6563 743a 2830 2c39 3429 2c33 322c 3332 3b6e 6f62 6a70 7472 5f5f 384c 504f 626a
4270060  6563 743a 2830 2c38 3629 3d2a 2830 2c38 3029 2c36 342c 3332 3b3b 004c 504f 626a 6563 743a 5a63 4c50 4f62 6a65 6374 3b4c
4270140  4f62 6a65 6374 3b5f 5f63 745f 5f38 4c50 4f62 6a65 6374 4650 374e 4f62 6a65 6374 5037 4c4f 626a 6563 7420 5f5f 6374 5f5f
4270220  384c 504f 626a 6563 7446 5243 384c 504f 626a 6563 7420 7365 744f 626a 6563 745f 5f38 4c50 4f62 6a65 6374 4650 374e 4f62
4270300  6a65 6374 2067 6574 4f62 6a65 6374 5f5f 384c 504f 626a 6563 7446 7620 6578 706c 6169 6e5f 5f38 4c50 4f62 6a65 6374 4650
4270360  6320 3b3b 3b00 5f5f 7074 626c 5f5f 384c 504f 626a 6563 745f 5f4d 475f 4d61 6e61 6765 725f 6378 783a 4728 302c 3333 2900
```

```
4270440  4c69 7374 3a54 2830 2c38 3729 3473 3132 636f 756e 745f 5f34 4c69 7374 3a28 302c 3129 2c30 2c33 323b 7074 724c 4f62 6a65
4270520  6374 5f5f 344c 6973 743a 2830 2c38 3429 2c33 322c 3332 3b5f 5f76 7074 725f 5f34 4c69 7374 3a28 302c 3333 292c 3634 2c33
4270600  323b 3b00 4c69 7374 3a5a 634c 6973 743b 3b5f 5f63 745f 5f34 4c69 7374 4676 205f 5f63 745f 5f34 4c69 7374 4652 4334 4c69
4270660  7374 205f 5f64 745f 5f34 4c69 7374 4676 2067 6574 436f 756e 745f 5f34 4c69 7374 4676 2067 6574 546f 705f 5f34 4c69 7374
4270740  4676 2073 6574 546f 705f 5f34 4c69 7374 4650 374c 4f62 6a65 6374 2065 7272 6f72 4d65 6d6f 7279 5f5f 344c 6973 7446 5063
4271020  5431 2062 726f 6164 6361 7374 5f5f 344c 6973 7446 4d36 4f62 6a65 6374 4676 5f76 2065 7870 6c61 696e 5f5f 344c 6973 7446
4271100  5063 205c 0069 6e73 6572 745f 5f34 4c69 7374 4650 374c 4f62 6a65 6374 2069 734d 656d 6265 725f 5f34 4c69 7374 4650 374c
4271160  4f62 6a65 6374 2069 734d 656d 6265 725f 5f34 4c69 7374 4650 6320 6973 4571 7561 6c5f 5f34 4c69 7374 4652 344c 6973 7420
4271240  7265 6d6f 7665 5f5f 344c 6973 7446 5063 203b 3b3b 005f 5f70 7462 6c5f 5f34 4c69 7374 5f5f 4d47 5f4d 616e 6167 6572 5f63
4271320  7878 3a47 2830 2c33 3329 0050 4c69 7374 3a54 2830 2c38 3829 3d73 3132 636f 756e 745f 5f34 4c69 7374 3a28 302c 3129 2c30
4271400  2c33 323b 7074 724c 4f62 6a65 6374 5f5f 344c 6973 743a 2830 2c38 3429 2c33 322c 3332 3b5f 5f76 7074 725f 5f34 4c69 7374
4271460  3a28 302c 3333 292c 3634 2c33 323b 3b00 504c 6973 743a 5a63 504c 6973 743b 4c69 7374 3b69 6e73 6572 745f 5f35 504c 6973
4271540  7446 5038 4c50 4f62 6a65 6374 2069 6e73 6572 745f 5f35 504c 6973 7446 5235 504c 6973 7420 536f 7274 5f50 4c69 7374 5f5f
4271620  3550 4c69 7374 4669 2072 6576 6572 7365 5f5f 3550 4c69 7374 4676 2069 6e73 6572 7441 6674 6572 5f5f 3550 4c69 7374 4650
4271700  384c 504f 626a 6563 7454 3120 7265 6d6f 7665 5f5f 3550 4c69 7374 4650 384c 504f 626a 6563 7420 7265 6d6f 7665 5f5f 3550
4271760  4c69 7374 4650 6320 6973 4d65 6d62 6572 5f5f 3550 4c69 7374 4650 6320 5c00 6973 4d65 6d62 6572 5f5f 3550 4c69 7374 4650
4272040  374c 4f62 6a65 6374 2069 7345 7175 616c 5f5f 3550 4c69 7374 4652 344c 6973 7420 6578 706c 6169 6e5f 5f35 504c 6973 7446
4272120  5063 205f 5f63 745f 5f35 504c 6973 7446 5243 3550 4c69 7374 205f 5f63 745f 5f35 504c 6973 7446 7620 3b3b 3b00 5f5f 7074
4272200  626c 5f5f 3550 4c69 7374 5f5f 4d47 5f4d 616e 6167 6572 5f63 7878 3a47 2830 2c33 3329 004c 6973 7449 7465 7261 746f 723a
4272260  5428 302c 3839 293d 7338 6c69 7374 5f5f 3132 4c69 7374 4974 6572 6174 6f72 3a28 302c 3930 293d 2a28 302c 3837 292c 302c
4272340  3332 3b70 5f5f 3132 4c69 7374 4974 6572 6174 6f72 3a28 302c 3834 292c 3332 2c33 323b 3b00 4c69 7374 4974 6572 6174 6f72
4272420  3a5a 634c 6973 7449 7465 7261 746f 723b 3b5f 5f63 745f 5f31 324c 6973 7449 7465 7261 746f 7246 5234 4c69 7374 2072 6573
4272500  6574 5f5f 3132 4c69 7374 4974 6572 6174 6f72 4676 2061 7474 6163 685f 5f31 324c 6973 7449 7465 7261 746f 7246 5234 4c69
4272560  7374 2067 6574 4375 7272 656e 745f 5f31 324c 6973 7449 7465 7261 746f 7246 7620 5f5f 7070 5f5f 3132 4c69 7374 4974 6572
4272640  6174 6f72 4676 293b 3b3b 0050 696e 4c65 6e67 7468 3a54 2830 2c39 3129 3d73 3136 5f5f 7670 7472 5f5f 364f 626a 6563 743a
4272720  2830 2c33 3329 2c30 2c33 323b 6e61 6d65 5f5f 374e 4f62 6a65 6374 3a28 302c 3230 292c 3332 2c33 323b 436c 656e 6774 685f
4273000  5f39 5069 6e4c 656e 6774 693a 2830 2c32 3029 2c36 342c 3332 3b49 6c65 6e67 7468 5f5f 3950 696e 4c65 6e67 7468 3a28 302c
4273060  3129 2c39 362c 3332 3b3b 0050 696e 4c65 6e67 7468 3a5a 6350 696e 4c65 6e67 7468 3b4e 4f62 6a65 6374 3b5f 5f63 745f 5f39
4273140  5069 6e4c 656e 6774 6846 5063 5431 205f 5f63 745f 5f39 5069 6e4c 656e 6774 6846 5243 3950 696e 4c65 6e67 7468 2073 6574
4273220  5f50 696e 4c65 6e67 7468 5f5f 3950 696e 4c65 6e67 7468 4650 6354 3120 6765 745f 495f 5069 6e4c 656e 6774 685f 5f39 5069
4273300  6e4c 656e 6774 6846 7620 6765 745f 495f 5069 6e4c 656e 6774 685f 5f39 5069 6e4c 656e 6774 6846 6920 3b3b 3b00 4d6f 6447
4273360  656e 3a54 2830 2c39 3229 3d73 3234 4269 7457 6964 7468 5f5f 364d 6f64 4765 6e3a 2830 2c31 292c 302c 3332 3b45 5374 6174
4273440  655f 5f36 4d6f 6447 656e 3a28 302c 3738 292c 3332 2c33 323b 5069 6e4e 616d 654c 656e 6774 685f 5f36 4d6f 6447 656e 3a28
4273520  302c 3839 292c 3634 2c39 363b 5f5f 7670 7472 5f5f 364d 6f64 4765 6e3a 2830 2c33 3329 2c31 3630 2c33 323b 3b00 4d6f 6447
4273600  656e 3a5a 634d 6f64 4765 6e3b 3b5f 5f63 745f 5f36 4d6f 6447 656e 4676 205f 5f63 745f 5f36 4d6f 6447 656e 4652 4336 4d6f
4273660  6447 656e 2073 6574 5f42 6974 5769 6474 685f 5f36 4d6f 6447 656e 4669 2073 6574 5f45 5374 6174 655f 5f35 4d6f 6447 656e
4273740  4637 426f 6f6c 6561 6e20 6765 745f 4553 7461 7465 5f5f 364d 6f64 4765 6e46 7620 7365 745f 5069 6e4c 656e 6774 685f 5f36
4274020  4d6f 6447 656e 4650 6354 3120 6765 745f 5069 6e4c 656e 6774 685f 5f36 4d6f 6447 656e 4650 6320 7365 7449 6e64 6578 5f5f
4274100  364d 6f64 4765 6e46 7620 5c00 7365 744e 6161 6549 6e64 6578 5f5f 364d 6f64 4765 6e46 5063 204c 6f61 645f 5648 444c 5f44
4274160  6174 615f 5f36 4d6f 6447 656e 4650 374e 4f62 6a65 6374 2043 6f6d 706f 7365 5f4d 6f64 4765 6e5f 4465 7363 7269 7074 6f72
4274240  5f5f 364d 6f64 4765 6e46 5063 2065 7870 6c61 696e 5f5f 364d 6f64 4765 6e46 7620 5f5f 6474 5f5f 364d 6f64 4765 6e46 7620
4274320  3b3b 3b00 5f5f 7074 626c 5f5f 364d 6f64 4765 6e5f 5f4d 475f 4d61 6e61 6765 725f 6378 783a 4728 302c 3333 2900 4164 6465
4274400  723a 5428 302c 3933 293d 7334 3442 6974 5769 6474 685f 5f36 4d6f 6447 656e 3a28 302c 3129 2c30 2c33 323b 4553 7461 7465
4274460  5f5f 364d 6f64 4765 6e3a 2830 2c37 3829 2c33 322c 3332 3b50 696e 4e61 6d65 4c65 6e67 7468 5f5f 364d 6f64 4765 6e3a 2830
4274540  2c38 3829 2c36 342c 3936 3b5f 5f76 7074 725f 5f36 4d6f 6447 656e 3a28 302c 3333 292c 3136 302c 3332 3b74 7970 655f 5f35
4274620  4164 6465 723a 2830 2c32 3029 2c31 3932 2c33 323b 6d61 696e 5f6d 656e 755f 5f35 4164 6465 723a 2830 2c31 292c 3232 342c
4274700  3332 3b73 7562 5f6d 656e 755f 5f35 4164 6465 723a 2830 2c31 292c 3235 362c 3332 3b6d 6f64 756c 656e 616d 655f 5f35 4164
4274760  6465 723a 2830 2c32 3029 2c32 3838 2c33 323b 6269 7473 5f5f 3541 6464 6572 3a28 302c 3129 2c33 3230 2c33 323b 3b00 4164
4275040  6465 723a 5a63 4164 6465 723b 416f 6447 656e 3b5f 5f63 745f 5f35 4164 6465 7246 5063 205f 5f63 745f 5f35 4164 6465 7246
4275120  7620 5f5f 6374 5f5f 3541 6464 6572 4652 4335 4164 6465 7220 5f5f 6474 5f5f 3541 6464 6572 4676 2073 6574 4e61 6d65 496e
4275200  6465 785f 5f35 4164 6465 7246 5063 2073 6574 496e 6465 785f 5f35 4164 6465 7246 7620 4c6f 6164 5f56 4844 4c5f 4461 7461
4275260  5f5f 3541 6464 6572 4650 374e 4f62 6a65 6374 2043 6f6d 706f 7365 5f41 6f64 4765 6e5f 4465 7363 7269 7074 6f72 5f5f 3541
4275340  6464 6572 4650 6320 5c00 3b3b 3b00 5f5f 7074 626c 5f5f 3541 6464 6572 5f5f 4d47 5f4d 616e 6167 6572 5f63 7878 3a47 2830
4275420  2c33 3329 004d 7578 3a54 2830 2c39 3429 3d73 3634 4269 7457 6964 7468 5f5f 364d 6f64 4765 6e3a 2830 2c31 292c 302c 3332
4275500  3b45 5374 6174 655f 5f36 4d6f 6447 656e 3a28 302c 3738 292c 3332 2c33 323b 5069 6e4e 616d 654c 656e 6774 685f 5f36 4d6f
```

| | | | | | | | | | | | | | | | | | | | | | | | | |
|---|---|---|---|---|---|---|---|---|---|---|---|---|---|---|---|---|---|---|---|---|---|---|---|---|
| 4275560 | 6447 | 656e | 3a28 | 302c | 3838 | 292c | 3634 | 2c39 | 363b | 5f5f | 7670 | 7472 | 5f5f | 364d | 6f64 | 4765 | 6e3a | 2830 | 2c33 | 3329 | 2c31 | 3630 | 2c33 | 323b |
| 4275640 | 7479 | 7065 | 5f5f | 334d | 7578 | 3a28 | 302c | 3230 | 292c | 3139 | 322c | 3332 | 3b6d | 6169 | 6e5f | 6d65 | 6e75 | 5f5f | 334d | 7578 | 3a28 | 302c | 3129 | 2c32 |
| 4275720 | 3234 | 2c33 | 323b | 7375 | 625f | 6d65 | 6e75 | 5f5f | 334d | 7578 | 3a28 | 302c | 3129 | 2c32 | 3536 | 2c33 | 323b | 6d6f | 6475 | 6c65 | 6e61 | 6d65 | 5f5f | 334d |
| 4276000 | 7578 | 3a28 | 302c | 3230 | 292c | 3238 | 382c | 3332 | 3b5c | 0062 | 6974 | 735f | 5f33 | 4d75 | 783a | 2830 | 2c31 | 292c | 3332 | 302c | 3332 | 3b47 | 6174 | 6564 |
| 4276060 | 4f50 | 5f5f | 334d | 7578 | 3a28 | 302c | 3738 | 292c | 3335 | 322c | 3332 | 3b45 | 6e63 | 6f64 | 6564 | 534c | 5f5f | 334d | 7578 | 3a28 | 302c | 3738 | 292c | 3338 |
| 4276140 | 342c | 3332 | 3b46 | 6173 | 745f | 5f33 | 4d75 | 783a | 2830 | 2c37 | 3829 | 2c34 | 3136 | 2c33 | 323b | 496e | 764f | 505f | 5f33 | 4d75 | 783a | 2830 | 2c37 | 3829 |
| 4276220 | 2c34 | 3438 | 2c33 | 323b | 4869 | 4472 | 6976 | 655f | 5f33 | 4d75 | 783a | 2830 | 2c37 | 3829 | 2c34 | 3830 | 2c33 | 323b | 3b00 | 4d75 | 783a | 5a63 | 4d75 | 783b |
| 4276300 | 4d6f | 6447 | 656e | 3b5f | 5f63 | 745f | 5f33 | 4d75 | 7846 | 5363 | 205f | 5f63 | 745f | 5f33 | 4d75 | 7846 | 7620 | 5f5f | 6374 | 5f5f | 334d | 7578 | 4652 | 4333 |
| 4276360 | 4d75 | 7820 | 5f5f | 6474 | 5f5f | 334d | 7578 | 4676 | 2073 | 6574 | 4e61 | 6d65 | 496e | 6465 | 785f | 5f33 | 4d75 | 7846 | 5063 | 2073 | 6574 | 496e | 6465 | 785f |
| 4276440 | 5f33 | 4d75 | 7846 | 7620 | 4c6f | 6164 | 5f56 | 4844 | 4c5f | 4461 | 7461 | 5f5f | 334d | 7578 | 4650 | 374e | 4f62 | 6a65 | 6374 | 2043 | 6f6d | 706f | 7365 | 5f4d |
| 4276520 | 6f64 | 4765 | 6e5f | 4465 | 7363 | 7269 | 7074 | 6f72 | 5f5f | 334d | 7578 | 4650 | 6320 | 3b3b | 3b00 | 5f5f | 7074 | 626c | 5f5f | 334d | 7578 | 5f5f | 4d47 | 5f4d |
| 4276600 | 616e | 6167 | 6572 | 5f63 | 7878 | 3a47 | 2830 | 2c33 | 3329 | 0043 | 6f75 | 6e74 | 6572 | 3a54 | 2830 | 2c39 | 3529 | 3d73 | 3736 | 4269 | 7457 | 6964 | 7468 | 5f5f |
| 4276660 | 364d | 6f64 | 4765 | 6e3a | 2830 | 2c31 | 292c | 302c | 3332 | 3b45 | 5374 | 6174 | 655f | 5f36 | 4d6f | 6447 | 656e | 3a28 | 302c | 3738 | 292c | 3332 | 2c33 | 323b |
| 4276740 | 5069 | 6e4e | 616d | 654c | 656e | 6774 | 685f | 5f36 | 4d6f | 6447 | 656e | 3a28 | 302c | 3838 | 292c | 3634 | 2c39 | 363b | 5f5f | 7670 | 7472 | 5f5f | 364d | 6f64 |
| 4277020 | 4765 | 6e3a | 2830 | 2c33 | 3329 | 2c31 | 3630 | 2c33 | 323b | 7479 | 7065 | 5f5f | 3743 | 6f75 | 6e74 | 6572 | 3a28 | 302c | 3230 | 292c | 3139 | 322c | 3332 | 3b6d |
| 4277100 | 6169 | 6e5f | 6d65 | 6e75 | 5f5f | 3743 | 6f75 | 6e74 | 6572 | 3a28 | 302c | 3129 | 2c32 | 3234 | 2c33 | 323b | 7375 | 625f | 6d65 | 6e75 | 5f5f | 3743 | 6f75 | 6e74 |
| 4277160 | 6572 | 3a28 | 302c | 3129 | 2c32 | 3536 | 2c33 | 323b | 6d6f | 6475 | 6c65 | 6e61 | 6d65 | 5f5f | 3743 | 6f75 | 6e74 | 6572 | 3a28 | 302c | 3230 | 292c | 3238 | 382c |
| 4277240 | 3332 | 3b5c | 0062 | 6974 | 735f | 5f37 | 436f | 756e | 7465 | 723a | 2830 | 2c31 | 292c | 3332 | 302c | 3332 | 3b43 | 4c4e | 5f5f | 3743 | 6f75 | 6e74 | 6572 | 3a28 |
| 4277320 | 302c | 3738 | 292c | 3335 | 322c | 3332 | 3b43 | 445f | 5f37 | 436f | 756e | 7465 | 723a | 2830 | 2c37 | 3829 | 2c33 | 3834 | 2c33 | 323b | 5344 | 5f5f | 3743 | 6f75 |
| 4277400 | 6e74 | 6572 | 3a28 | 302c | 3738 | 292c | 3431 | 362c | 3332 | 3b43 | 455f | 5f37 | 436f | 756e | 7465 | 723a | 2830 | 2c37 | 3829 | 2c34 | 3438 | 2c33 | 323b | 414c |
| 4277460 | 5f5f | 3743 | 6f75 | 6e74 | 6572 | 3a28 | 302c | 3738 | 292c | 3438 | 302c | 3332 | 3b53 | 544e | 5f5f | 3743 | 6f75 | 6e74 | 6572 | 3a28 | 302c | 3738 | 292c | 3531 |
| 4277540 | 322c | 3332 | 3b4c | 445f | 5f37 | 436f | 756e | 7465 | 723a | 2830 | 2c37 | 3829 | 2c35 | 3434 | 2c33 | 323b | 5261 | 6e67 | 655f | 5f37 | 436f | 756e | 7465 | 723a |
| 4277620 | 2830 | 2c37 | 3829 | 2c35 | 3736 | 2c33 | 323b | 3b00 | 436f | 756e | 7465 | 723a | 5a63 | 436f | 756e | 7465 | 723b | 4d6f | 6447 | 656e | 3b5f | 5f63 | 745f | 5f37 |
| 4277700 | 436f | 756e | 7465 | 7246 | 5063 | 205f | 5f63 | 745f | 5f37 | 436f | 756e | 7465 | 7246 | 7620 | 5f5f | 6374 | 5f5f | 3743 | 6f75 | 6e74 | 6572 | 4652 | 4337 | 436f |
| 4277760 | 756e | 7465 | 7220 | 5f5f | 6474 | 5f5f | 3743 | 6f75 | 6e74 | 6572 | 4676 | 2073 | 6574 | 4e61 | 6d65 | 496e | 6465 | 785f | 5f37 | 436f | 756e | 7465 | 7246 | 5063 |
| 4300040 | 2073 | 6574 | 496e | 6465 | 785f | 5f37 | 436f | 756e | 7465 | 7246 | 7620 | 4c6f | 6164 | 5f56 | 4844 | 4c5f | 4461 | 7461 | 5f5f | 3743 | 6f75 | 6e74 | 6572 | 4650 |
| 4300120 | 374e | 4f62 | 6a65 | 6374 | 2043 | 6f6d | 706f | 7365 | 5f4d | 6f64 | 4765 | 6e5f | 4465 | 7363 | 7269 | 7074 | 6f72 | 5f5f | 3743 | 6f75 | 6e74 | 6572 | 4650 | 6320 |
| 4300200 | 5c00 | 3b3b | 3b00 | 5f5f | 7074 | 626c | 5f5f | 3743 | 6f75 | 6e74 | 6572 | 5f5f | 4d47 | 5f4d | 616e | 6167 | 6572 | 5f63 | 7878 | 3a47 | 2830 | 2c33 | 3329 | 0044 |
| 4300260 | 6563 | 6f64 | 6572 | 3a54 | 2830 | 2c39 | 3629 | 3d73 | 3536 | 4269 | 7457 | 6964 | 7468 | 5f5f | 364d | 6f64 | 4765 | 6e3a | 2830 | 2c31 | 292c | 302c | 3332 | 3b45 |
| 4300340 | 5374 | 6174 | 655f | 5f36 | 4d6f | 6447 | 656e | 3a28 | 302c | 3738 | 292c | 3332 | 2c33 | 323b | 5069 | 6e4e | 616d | 654c | 656e | 6774 | 685f | 5f36 | 4d6f | 6447 |
| 4300420 | 656e | 3a28 | 302c | 3838 | 292c | 3634 | 2c39 | 363b | 5f5f | 7670 | 7472 | 5f5f | 364d | 6f64 | 4765 | 6e3a | 2830 | 2c33 | 3329 | 2c31 | 3630 | 2c33 | 323b | 7479 |
| 4300500 | 7065 | 5f5f | 3744 | 6563 | 6f64 | 6572 | 3a28 | 302c | 3230 | 292c | 3139 | 322c | 3332 | 3b6d | 6169 | 6e5f | 6d65 | 6e75 | 5f5f | 3744 | 6563 | 6f64 | 6572 | 3a28 |
| 4300560 | 302c | 3129 | 2c32 | 3234 | 2c33 | 323b | 7375 | 625f | 6d65 | 6e75 | 5f5f | 3744 | 6563 | 6f64 | 6572 | 3a28 | 302c | 3129 | 2c32 | 3536 | 2c33 | 323b | 6d6f | 6475 |
| 4300640 | 6c65 | 6e61 | 6d65 | 5f5f | 3744 | 6563 | 6f64 | 6572 | 3a28 | 302c | 3230 | 292c | 3238 | 382c | 3332 | 3b5c | 0062 | 6974 | 735f | 5f37 | 4465 | 636f | 6465 | 723a |
| 4300720 | 2830 | 2c31 | 292c | 3332 | 302c | 3332 | 3b47 | 6174 | 6564 | 4f50 | 5f5f | 3744 | 6563 | 6f64 | 6572 | 3a28 | 302c | 3738 | 292c | 3335 | 322c | 3332 | 3b41 | 6374 |
| 4301000 | 6976 | 6548 | 694f | 505f | 5f37 | 4465 | 636f | 6465 | 723a | 2830 | 2c37 | 3829 | 2c33 | 3834 | 2c33 | 323b | 4869 | 4472 | 6976 | 655f | 5f37 | 4465 | 636f | 6465 |
| 4301060 | 723a | 2830 | 2c37 | 3829 | 2c34 | 3136 | 2c33 | 323b | 3b00 | 4465 | 636f | 6465 | 723a | 5a63 | 4465 | 636f | 6465 | 723b | 4d6f | 6447 | 656e | 3b5f | 5f63 | 745f |
| 4301140 | 5f37 | 4465 | 636f | 6465 | 7246 | 5063 | 205f | 5f63 | 745f | 5f37 | 4465 | 636f | 6465 | 7246 | 7620 | 5f5f | 6374 | 5f5f | 3744 | 6563 | 6f64 | 6572 | 4652 | 4337 |
| 4301220 | 4465 | 636f | 6465 | 7220 | 5f5f | 6474 | 5f5f | 3744 | 6563 | 6f64 | 6572 | 4676 | 2073 | 6574 | 4e61 | 6d65 | 496e | 6465 | 785f | 5f37 | 4465 | 636f | 6465 | 7246 |
| 4301300 | 5063 | 2073 | 6574 | 496e | 6465 | 785f | 5f37 | 4465 | 636f | 6465 | 7246 | 7620 | 4c6f | 6164 | 5f56 | 4844 | 4c5f | 4461 | 7461 | 5f5f | 3744 | 6563 | 6f64 | 6572 |
| 4301360 | 4650 | 374e | 4f62 | 6a65 | 6374 | 2043 | 6f6d | 706f | 7365 | 5f4d | 6f64 | 4765 | 6e5f | 4465 | 7363 | 7269 | 7074 | 6f72 | 5f5f | 3744 | 6563 | 6f64 | 6572 | 4650 |
| 4301440 | 6320 | 5c00 | 3b3b | 3b00 | 5f5f | 7074 | 626c | 5f5f | 3744 | 6563 | 6f64 | 6572 | 5f5f | 4d47 | 5f4d | 616e | 6167 | 6572 | 5f63 | 7878 | 3a47 | 2830 | 2c33 | 3329 |
| 4301520 | 0044 | 4963 | 7265 | 6d65 | 6e74 | 6f72 | 3a54 | 2830 | 2c39 | 3729 | 3d73 | 3438 | 4269 | 7457 | 6964 | 7468 | 5f5f | 364d | 6f64 | 4765 | 6e3a | 2830 | 2c31 | 292c |
| 4301600 | 302c | 3332 | 3b45 | 5374 | 6174 | 655f | 5f36 | 4d6f | 6447 | 656e | 3a28 | 302c | 3738 | 292c | 3332 | 2c33 | 323b | 5069 | 6e4e | 616d | 654c | 656e | 6774 | 685f |
| 4301660 | 5f36 | 4d6f | 6447 | 656e | 3a28 | 302c | 3838 | 292c | 3634 | 2c39 | 363b | 5f5f | 7670 | 7472 | 5f5f | 364d | 6f64 | 4765 | 6e3a | 2830 | 2c33 | 3329 | 2c31 | 3630 |
| 4301740 | 2c33 | 323b | 7479 | 7065 | 5f5f | 3131 | 4449 | 6372 | 656d | 656e | 746f | 723a | 2830 | 2c32 | 3029 | 2c31 | 3932 | 2c33 | 323b | 6d61 | 696e | 5f6d | 656e | 755f |
| 4302020 | 5f31 | 3144 | 4963 | 7265 | 6d65 | 6e74 | 6f72 | 3a28 | 302c | 3129 | 2c32 | 3234 | 2c33 | 323b | 7375 | 625f | 6d65 | 6e75 | 5f5f | 3131 | 4449 | 6372 | 656d | 656e |
| 4302100 | 746f | 723a | 2830 | 2c31 | 292c | 3235 | 362c | 3332 | 3b6d | 6f64 | 756c | 656e | 616d | 655f | 5f31 | 3144 | 4963 | 7265 | 6d65 | 6e74 | 6f72 | 3a28 | 302c | 3230 |
| 4302160 | 292c | 3238 | 382c | 3332 | 3b5c | 0062 | 6974 | 735f | 5f31 | 3144 | 4963 | 7265 | 6d65 | 6e74 | 6f72 | 3a28 | 302c | 3129 | 2c33 | 3230 | 2c33 | 323b | 6661 | 7374 |
| 4302240 | 5f5f | 3131 | 4449 | 6372 | 656d | 656e | 746f | 723a | 2830 | 2c37 | 3829 | 2c33 | 3532 | 2c33 | 323b | 3b00 | 4449 | 6372 | 656d | 656e | 746f | 723a | 5a63 | 4449 |
| 4302320 | 6372 | 656d | 656e | 746f | 723b | 4d6f | 6447 | 656e | 3b5f | 5f63 | 745f | 5f31 | 3144 | 4963 | 7265 | 6d65 | 6e74 | 6f72 | 4650 | 6320 | 5f5f | 6374 | 5f5f | 3131 |
| 4302400 | 4449 | 6372 | 656d | 656e | 746f | 7246 | 7620 | 5f5f | 6374 | 5f5f | 3131 | 4449 | 6372 | 656d | 656e | 746f | 7246 | 5243 | 3131 | 4449 | 6372 | 656d | 656e | 746f |
| 4302460 | 7220 | 5f5f | 6474 | 5f5f | 3131 | 4449 | 6372 | 656d | 656e | 746f | 7246 | 7620 | 7365 | 744e | 616d | 6549 | 6e64 | 6578 | 5f5f | 3131 | 4449 | 6372 | 656d | 656e |
| 4302540 | 746f | 7246 | 5063 | 2073 | 6574 | 496e | 6465 | 785f | 5f31 | 3144 | 4963 | 7265 | 6d65 | 6e74 | 6f72 | 4676 | 205c | 004c | 6f61 | 645f | 5648 | 444c | 5f44 | 6174 |
| 4302620 | 615f | 5f31 | 3144 | 4963 | 7265 | 6d65 | 6e74 | 6f72 | 4650 | 374e | 4f62 | 6a65 | 6374 | 2043 | 6f6d | 706f | 7365 | 5f4d | 6f64 | 4765 | 6e5f | 4465 | 7363 | 7269 |

```
4302700  7074 6f72 5f5f 3131 4449 6372 656d 656e 746f 7246 5063 203b 3b3b 005f 5f70 7462 6c5f 5f31 3144 4963 7265 6d65 6e74 6f72
4302760  5f5f 4d47 5f4d 616e 6167 6572 5f63 7878 3a47 2830 2c33 3329 0046 6966 6f3a 5428 302c 3938 293d 7334 3842 6974 5769 6474
4303040  685f 5f36 4d6f 6447 656e 3a28 302c 3129 2c30 2c33 323b 4553 7461 7465 5f5f 364d 6f64 4765 6e3a 2830 2c37 3829 2c33 322c
4303120  3332 3b50 696e 4e61 6d65 4c65 6e67 7468 5f5f 364d 6f64 4765 6e3a 2830 2c38 3829 2c36 342c 3936 3b5f 5f76 7074 725f 5f36
4303200  4d6f 6447 656e 3a28 302c 3333 292c 3136 302c 3332 3b74 7970 655f 5f34 4669 666f 3a28 302c 3230 292c 3139 322c 3332 3b6d
4303260  6169 6e5f 6d65 6e75 5f5f 3446 6966 6f3a 2830 2c31 292c 3232 342c 3332 3b73 7562 5f6d 656e 755f 5f34 4669 666f 3a28 302c
4303340  3129 2c32 3536 2c33 323b 6d6f 6475 6c65 6e61 6d65 5f5f 3446 6956 6f3a 2830 2c32 3029 2c32 3838 2c33 323b 5c00 7769 6474
4303420  685f 5f34 4669 666f 3a28 302c 3129 2c33 3230 2c33 323b 6465 7074 685f 5f34 4669 666f 3a28 302c 3129 2c33 3532 2c33 323b
4303500  3b00 4669 666f 3a5a 6346 6966 6f3b 4d6f 6447 656e 3b5f 5f63 745f 5f34 4669 666f 4650 6320 5f5f 6374 5f5f 3446 6966 6f46
4303560  7620 5f5f 6374 5f5f 3446 6966 6f46 5243 3446 6966 6f20 5f5f 6474 5f5f 3446 6966 6f46 7620 7365 744e 616d 6549 6e64 6578
4303640  5f5f 3446 6966 6f46 5063 2073 6574 496e 6465 785f 5f34 4669 666f 4676 204c 6f61 645f 5648 444c 5f44 6174 615f 5f34 4669
4303720  666f 4650 374e 4f62 6a65 6374 2043 6f6d 706f 7365 5f4d 6f64 4765 6e5f 4465 7363 7269 7074 6f72 5f5f 3446 6966 6f46 5063
4304000  205c 003b 3b3b 005f 5f70 7462 6c5f 5f34 4669 666f 5f5f 4d47 5f4d 616e 6167 6572 5f63 7878 3a47 2830 2c33 3329 004d 475f
4304060  436f 6d70 5479 7065 3a54 2830 2c39 3929 3d65 556e 6b6e 6f77 6e43 543a 302c 4c42 535f 6164 6465 723a 312c 4c42 535f 636f
4304140  756e 7465 723a 322c 4c42 535f 6375 783a 332c 4c42 535f 6465 636f 6465 723a 342c 4c42 535f 6469 6e63 7265 6d65 6e74 6f72
4304220  3a35 2c4c 4253 5f66 6966 6f3a 362c 3b00 5f5f 6374 5f5f 3541 6464 6572 4676 3a66 2830 2c31 3030 293d 2a28 302c 3933 2900
4304300  5f5f 3074 6869 733a 7028 302c 3130 3029 002e 2f68 7878 2f41 6464 6572 2e68 7878 005f 5f30 7468 6973 3a72 2830 2c31 3030
4304360  2900 5f5f 305f 5f58 4230 3079 696a 306e 6f3a 2830 2c37 3829 005f 5f30 7468 6973 203a 5a74 6c00 5f5f 6374 5f5f 3541 6464
4304440  6572 4676 203a 5a74 4600 5f5f 6374 5f5f 334d 7578 4676 3a66 2830 2c31 3031 293d 2a28 302c 3934 2900 5f5f 3074 6869 733a
4304520  7028 302c 3130 3129 002e 2f68 7878 2f4d 7578 2e68 7878 005f 5f30 7468 6973 3a72 2830 2c31 3031 2900 5f5f 305f 5f58 4230
4304600  3079 696a 3065 6d3a 2830 2c37 3829 005f 5f30 7468 6973 203a 5a74 6c00 5f5f 6374 5f5f 334d 7578 4676 203a 5a74 4600 5f5f
4304660  6374 5f5f 3744 6563 6f64 6572 4676 3a66 2830 2c31 3032 293d 2a28 302c 3936 2900 5f5f 3074 6869 733a 7028 302c 3130 3229
4304740  002e 2f68 7878 2f44 6563 6f64 6572 2e68 7878 005f 5f30 7468 6973 3a72 2830 2c31 3032 2900 5f5f 305f 5f58 4230 3079 696a
4305020  3066 633a 2830 2c37 3829 005f 5f30 7468 6973 203a 5a74 6c00 5f5f 6374 5f5f 3744 6563 6f64 6572 4676 203a 5a74 4600 5f5f
4305100  6374 5f5f 3131 4449 6372 656d 656e 746f 7246 763a 6628 302c 3130 3329 3d2a 2830 2c39 3729 005f 5f30 7468 6973 3a70 2830
4305160  2c31 3033 2900 2e2f 6878 782f 4449 6372 656d 656e 746f 722e 6878 7800 5f5f 3074 6869 733a 7228 302c 3130 3329 005f 5f30
4305240  5f5f 5842 3030 7969 6a30 6965 3a28 302c 3738 2900 5f5f 3074 6869 7320 3a5a 746c 005f 5f63 745f 5f31 3144 4963 7265 6d65
4305320  6e74 6f72 4676 203a 5a74 4600 5f5f 6374 5f5f 3446 6966 6f46 763a 6628 302c 3130 3429 3d2a 2830 2c39 3829 005f 5f30 7468
4305400  6973 3a70 2830 2c31 3034 2900 2e2f 6878 782f 4669 666f 2e68 7878 005f 5f30 7468 6973 3a72 2830 2c31 3034 2900 5f5f 305f
4305460  5f58 4230 3079 696a 306a 623a 2830 2c37 3829 005f 5f30 7468 6973 203a 5a74 6c00 5f5f 6374 5f5f 3446 6966 6f46 7620 3a5a
4305540  7446 005f 5f63 745f 5f37 436f 756e 7465 7246 763a 6628 302c 3130 3529 3d2a 2830 2c39 3529 005f 5f30 7468 6973 3a70 2830
4305620  2c31 3035 2900 2e2f 6878 782f 436f 756e 7465 722e 6878 7800 5f5f 3074 6869 733a 7228 302c 3130 3529 005f 5f30 5f5f 5842
4305700  3030 7969 6a30 616b 3a28 302c 3738 2900 5f5f 3074 6869 7320 3a5a 746c 005f 5f63 745f 5f37 436f 756e 7465 7246 7620 3a5a
4305760  7446 0067 6574 5f4d 6f64 4765 6e5f 436f 6d70 5074 725f 5f46 5063 5431 3a46 2830 2c31 3036 293d 2a28 302c 3932 2900 5f5f
4306040  3074 7970 653a 7028 302c 3230 2900 5f5f 304d 475f 4e61 6d65 3a70 2830 2c32 3029 004d 475f 4d61 6e61 6765 722e 6378 7800
4306120  5f5f 314d 4744 5074 723a 2830 2c31 3036 2900 5f5f 3143 6f6d 705f 5479 7065 3a28 302c 3939 2900 5f5f 3074 7970 6520 3a5a
4306200  746c 005f 5f30 4447 5f4e 616d 6520 3a5a 746c 005f 5f31 4d47 4450 7472 203a 5a74 6c00 5f5f 3143 6f6d 705f 5479 7065 203a
4306260  5a74 6c00 6765 745f 4d6f 6447 656e 5f43 6f6d 7050 7472 5f5f 4650 6354 3120 3a5a 7446 005f 5f73 7469 5f5f 4d47 5f4d 616e
4306340  6167 6572 5f63 7878 5f67 6574 5f4d 6f64 4765 6e5f 436f 6d70 5074 725f 3a46 2830 2c32 2900 2f75 7372 2f43 432f 7375 6e34
4306420  2f69 6e63 6c2f 696f 7374 7265 616d 2e68 005f 5f73 7464 5f5f 4d47 5f4d 616e 6167 6572 5f63 7878 5f67 6574 5f4d 6f64 4765
4306500  6e5f 436f 6d70 5074 725f 3a46 2830 2c32 2900 5f5f 7674 626c 5f5f 384c 504f 626a 6563 745f 5f4d 475f 4d61 6e61 6765 725f
4306560  6378 783a 4728 302c 3130 3729 3461 7228 302c 3129 3b30 3b33 3b28 302c 3135 2900 6578 706c 6169 6e5f 5f38 4c50 4f62 6a65
4306640  6374 4650 633a 6628 302c 3229 005f 5f30 7468 6973 3a70 2830 2c31 3038 293d 2a28 302c 3835 2900 5f5f 3073 3a70 2830 2c32
4306720  3029 002f 686f 6465 2f6f 7361 7331 2f61 2f61 622f 7372 632f 6e65 776f 626a 6563 7473 2f68 7878 2f4c 504f 626a 6563 745f
4307000  6462 2e68 7878 005f 5f30 7468 6973 3a72 2830 2c31 3038 2900 5f5f 3074 6869 7320 3a5a 746c 005f 5f30 7320 3a5a 746c 0065
4307060  7870 6c61 696e 5f5f 384c 504f 626a 6563 7446 5063 203a 5a74 4600 696e 4f72 6465 725f 5f36 4f62 6a65 6374 4650 364f 626a
4307140  6563 743a 6628 302c 3129 005f 5f30 7468 6973 3a70 2830 2c31 3039 293d 2a28 302c 3739 2900 5f5f 305f 5f41 3237 3a70 2830
4307220  2c31 3039 2900 2f68 6f6d 652f 6f73 6173 312f 612f 6162 2f73 7263 2f6e 6577 6f62 6a65 6374 732f 6878 782f 4f62 6a65 6374
4307300  5f64 622e 6878 7800 5f5f 3074 6869 7320 3a5a 746c 005f 5f30 5f5f 4132 3720 3a5a 746c 0069 6e4f 7264 6572 5f5f 364f 626a
4307360  6563 7446 5036 4f62 6a65 6374 203a 5a74 4600 7670 7269 6e74 662e 6f00 5f72 6373 5f69 6400 2f68 6f6d 652f 6673 3130 2f62
4307440  2f74 6f6f 6c6c 6962 2f72 656c 3130 302f 0073 2130 302f 7570 7269 6e74 662e 6300 696e 743a 7428 302c 3129 3d72 2830 2c31
4307520  293b 2d32 3134 3734 3833 3634 383b 3231 3437 3438 3336 3437 3b00 6368 6172 3a74 2830 2c32 293d 7228 302c 3229 3b30 3b31
4307600  3237 3b00 6c6f 6e67 3a74 2830 2c33 293d 7228 302c 3129 3b2d 3231 3437 3438 3336 3438 3b32 3134 3734 3833 3634 373b 0073
4307660  686f 7274 3a74 2830 2c34 293d 7228 302c 3129 3b2d 3332 3736 383b 3332 3736 373b 0075 6e73 6967 6e65 6420 6368 6172 3a74
4307740  2830 2c35 293d 7228 302c 3129 3b30 3b32 3535 3b00 756e 7369 676e 6564 2073 686f 7274 3a74 2830 2c36 293d 7228 302c 3129
```

4310020 3b30 3b36 3535 3335 3b00 756e 7369 676e 6564 206c 6f6e 673a 7428 302c 3729 3d72 2830 2c31 293b 303b 2d31 3b00 756e 7369
4310100 676e 6564 2069 6e74 3a74 2830 2c38 293d 7228 302c 3129 3b30 3b2d 313b 0066 6c6f 6174 3a74 2830 2c39 293d 7228 302c 3129
4310160 3b34 3b33 3b00 646f 7562 6c65 3a74 2830 2c31 3029 3d72 2830 2c31 293b 383b 303b 0076 6f69 643a 7428 302c 3131 293d 2830
4310240 2c31 3129 003f 3f3f 3a74 2830 2c31 3229 3d28 302c 3129 0072 6373 5f69 643a 5328 302c 3133 293d 6172 2830 2c31 293b 303b
4310320 3731 3b28 302c 3229 002f 7573 722f 696e 636c 7564 652f 7374 7269 6e67 2e68 002f 7573 722f 696e 636c 7564 652f 7374 6469
4310400 6f2e 6800 2f75 7372 2f69 6e63 6c75 6465 2f76 6172 6172 6773 2e68 0076 7072 696e 7466 3a46 2830 2c31 2900 666f 726d 6174
4310460 3a70 2833 2c31 2900 7076 6172 3a70 2833 2c31 2900 7666 7072 696e 7466 3a46 2830 2c31 2900 6669 6c65 3a70 2830 2c31 3429
4310540 3d2a 2832 2c31 2900 666f 726d 6174 3a70 2833 2c31 2900 7076 6172 3a70 2833 2c31 2900 6275 6666 6572 3a28 302c 3135 293d
4310620 6172 2830 2c31 293b 303b 3239 3b28 302c 3229 0069 3a28 302c 3129 006a 3a28 302c 3129 006b 3a28 302c 3129 0069 6e74 303a
4310700 2830 2c31 2900 696e 7431 3a28 302c 3129 0069 6e74 323a 2830 2c31 2900 646f 7562 6c65 303a 2830 2c31 3029 0073 756d 3a28
4310760 302c 3129 0076 7370 7269 6e74 663a 4628 332c 3129 0073 7472 696e 673a 7028 332c 3129 0066 6f72 6d61 743a 7028 332c 3129
4311040 0070 7661 723a 7028 332c 3129 0062 7566 6665 723a 2830 2c31 3529 0069 3a28 302c 3129 006a 3a28 302c 3129 006b 3a28 302c
4311120 3129 0069 6e74 303a 2830 2c31 2900 696e 7431 3a28 302c 3129 0069 6e74 323a 2830 2c31 2900 646f 7562 6c65 303a 2830 2c31
4311200 3029 0065 6873 7461 636b 2e6f 005f 6568 5f69 6400 5f66 7265 655f 6c69 7374 005f 6d6c 5f69 6400 5f73 7461 636b 5f74 6f70
4311260 005f 7263 735f 6964 002f 686f 6d65 2f66 7331 302f 622f 746f 6f6c 6c69 622f 7265 6c31 3030 2f00 732d 3032 2f65 6873 7461
4311340 636b 2e63 0069 6e74 3a74 2830 2c31 293d 7228 302c 3129 3b2d 3231 3437 3438 3336 3438 3b32 3134 3734 3833 3634 373b 0063
4311420 6861 723a 7428 302c 3229 3d72 2830 2c32 293b 303b 3132 373b 006c 6f6e 673a 7428 302c 3329 3d72 2830 2c31 293b 2d32 3134
4311500 3734 3833 3634 383b 3231 3437 3438 3336 3437 3b00 7368 6f72 743a 7428 302c 3429 3d72 2830 2c31 293b 2d33 3237 3638 3b33
4311560 3237 3637 3b00 756e 7369 676e 6564 2063 6861 723a 7428 302c 3529 3d72 2830 2c31 293b 303b 3235 353b 0075 6e73 6967 6e65
4311640 6420 7368 6f72 743a 7428 302c 3629 3d72 2830 2c31 293b 303b 3635 3533 353b 0075 6e73 6967 6e65 6420 6c6f 6e67 3a74 2830
4311720 2c37 293d 7228 302c 3129 3b30 3b2d 313b 0075 6e73 6967 6e65 6420 696e 743a 7428 302c 3829 3d72 2830 2c31 293b 303b 2d31
4312000 3b00 666c 6f61 743a 7428 302c 3929 3d72 2830 2c31 293b 343b 303b 0064 6f75 626c 653a 7428 302c 3130 293d 7228 302c 3129
4312060 3b38 3b30 3b00 766f 6964 3a74 2830 2c31 3129 3128 302c 3131 2900 3f3f 3f3a 7428 302c 3132 293d 2830 2c31 2900 7263 735f
4312140 6964 3a53 2830 2c31 3329 3d61 7228 302c 3129 3b30 3b37 313b 2830 2c32 2900 2f75 7372 2f69 6e63 6c75 6465 2f73 7464 696f
4312220 2e68 002f 7573 722f 696e 636c 7564 652f 7661 7261 7267 732e 6800 696e 636c 7564 652f 6d6c 2e68 0069 6e63 6c75 6465 2f6d
4312300 6c2e 6800 6d6c 5f69 643a 5328 332c 3129 3d61 7228 302c 3129 3b30 3b36 363b 2830 2c32 2900 732d 3032 2f65 682e 6800 732d
4312360 3032 2f65 682e 6800 6568 5f69 643a 5328 332c 3129 0065 685f 6578 6365 7074 696f 6e3a 7428 302c 3129 0062 6f6f 6c65 616e
4312440 3a74 2830 2c31 2900 6568 5f73 7461 636b 5f6e 6f64 655f 7374 7275 6374 3a54 2830 2c31 3429 3d73 386e 6578 743a 2830 2c31
4312520 3529 3d2a 2830 2c31 3429 2c30 2c33 323b 6861 6e64 6c65 723a 2830 2c31 3629 3d2a 2830 2c31 3729 3d66 2830 2c31 3129 2c33
4312600 322c 3332 3b3b 0065 685f 7374 6163 6b5f 6e6f 6465 5f73 7472 7563 743a 7428 302c 3134 2900 6568 5f73 7461 636b 5f6e 6f64
4312660 653a 7428 302c 3135 2900 6672 6565 5f6c 6973 743a 5328 302c 3135 2900 732d 3032 2f65 6873 7461 636b 2e63 0073 7461 636b
4312740 5f74 6f70 3a53 2830 2c31 3529 0065 685f 7261 6973 655f 6578 6365 7074 696f 6e3a 4628 302c 3131 2900 5f5f 6275 696c 7469
4313020 6e5f 7661 5f61 6c69 7374 3a70 2830 2c31 2900 7076 6172 3a28 322c 3129 0065 7863 6570 7469 6f6e 3a28 302c 3129 0065 685f
4313100 7075 7368 5f68 616e 646c 6572 3a46 2830 2c31 3129 0068 616e 646c 6572 3a70 2830 2c31 3629 006e 6f64 653a 2830 2c31 3529
4313160 0065 685f 706f 705f 6861 6e64 6c65 723a 4629 302c 3136 2900 6e6f 6465 3a28 302c 3135 2900 6861 6e64 6c65 723a 2830 2c31
4313240 3629 0065 685f 6973 5f73 7461 636b 5f65 6d70 7479 3a46 2830 2c31 2900 6568 5f70 6173 735f 6578 6365 7074 696f 6e3a 4628
4313320 302c 3131 2900 6578 6365 7074 696f 6e3a 7028 302c 3129 0070 7661 723a 7028 322c 3129 0068 616e 646c 6572 3a28 302c 3136
4313400 2900 6568 5f64 6566 6175 6c74 5f68 616e 646c 6572 3a46 2830 2c31 3129 0065 7863 6570 7469 6f6e 3a70 2830 2c31 2900 7076
4313460 6172 3a70 2832 2c31 2900 6569 5f73 7461 636b 5f73 735f 6c6f 673a 4629 302c 3131 2900 6c6f 6767 6572 3a70 2830 2c31 3629
4313540 0065 6874 6162 6c65 2e6f 005f 6e65 7874 005f 6568 5f69 6400 5f6d 6c5f 6964 005f 7461 626c 655f 7374 6174 6963 005f 6568
4313620 7461 626c 655f 6964 005f 7461 626c 655f 6479 6e61 6d69 6300 5f65 685f 6d61 6b65 5f74 6162 6c65 5f6e 6f64 6500 5f72 6373
4313700 5f69 6400 2f68 6f6d 652f 6673 3130 2f62 2f74 6f6f 6c6c 6962 2f72 656c 3130 302f 0073 2d30 322f 6568 7461 626c 652e 6300
4313760 696e 743a 7428 302c 3129 3d72 2830 2c31 293b 2d32 3134 3734 3833 3634 383b 3231 3437 3438 3336 3437 3b00 6368 6172 3a74
4314040 2830 2c32 293d 7228 302c 3229 3b30 3b31 3237 3b00 6c6f 6e67 3a74 2830 2c33 293d 7228 302c 3129 3b2d 3231 3437 3438 3336
4314120 3438 3b32 3134 3734 3833 3634 373b 0073 686f 7274 3a74 2830 2c34 293d 7228 302c 3129 3b2d 3332 3736 383b 3332 3736 373b
4314200 0075 6e73 6967 6e65 6420 6368 6172 3a74 2830 2c35 293d 7228 302c 3129 3b30 3b32 3535 3b00 756e 7369 676e 6564 2073 686f
4314260 7274 3a74 2830 2c36 293d 7228 302c 3129 3b30 3b36 3535 3335 3b00 756e 7369 676e 6564 206c 6f6e 673a 7428 302c 3729 3d72
4314340 2830 2c31 293b 303b 2d31 3b00 756e 7369 676e 6564 2069 6e74 3a74 2830 2c38 293d 7228 302c 3129 3b30 3b2d 313b 0066 6c6f
4314420 6174 3a74 2830 2c39 293d 7228 302c 3129 3b34 3b30 3b00 646f 7562 6c65 3a74 2830 2c31 3029 3d72 2830 2c31 293b 383b 303b
4314500 0076 6f69 643a 7428 302c 3131 293d 2830 2c31 3129 003f 3f3f 3a74 2830 2c31 3229 3d28 302c 3129 0072 6373 5f69 643a 5328
4314560 302c 3133 293d 6172 2830 2c31 293b 303b 3731 3b28 302c 3229 002f 7573 722f 696e 636c 7564 652f 7374 7269 6e67 2e68 0069
4314640 6e63 6c75 6465 2f6d 6c2e 6800 696e 636c 7564 652f 6d6c 2e68 006d 6c5f 6964 3a53 2832 2c31 293d 6172 2830 2c31 293b 303b
4314720 3636 3b28 302c 3229 0073 2d30 322f 6568 2e68 0073 2d30 322f 6568 2e68 0065 685f 6964 3a53 2832 2c31 2900 6568 5f65 7863
4315000 6570 7469 6f6e 3a74 2830 2c31 2900 626f 6f6c 6561 6e3a 7428 302c 3129 0073 2d30 322f 6568 7461 626c 652e 6300 732d 3032
4315060 2f65 6874 6162 6c65 2e68 0065 6874 6162 6c65 5f69 643a 5328 302c 3133 2900 7461 626c 655f 7374 6174 6963 3a53 2834 2c31

```
4315140 293d 6172 2830 2c31 293b 303b 3334 3b28 342c 3229 3d2a 2830 2c32 2900 6568 5f74 6162 6c65 5f6e 6f64 655f 7374 7275 6374
4315220 3a54 2830 2c31 3429 3d73 3136 6578 6365 7074 696f 6e3a 2830 2c31 292c 302c 3332 3b66 6f72 6d61 743a 2834 2c32 292c 3332
4315300 2c33 323b 6c65 6674 3a28 302c 3135 293d 2a28 302c 3134 292c 3634 2c33 323b 7269 6768 743a 2830 2c31 3529 2c39 362c 3332
4315360 3b3b 0065 685f 7461 626c 655f 6e6f 6465 5f73 7472 7563 743a 7428 302c 3134 2900 6568 5f74 6162 6c65 5f6e 6f64 653a 7428
4315440 302c 3135 2900 6e65 7874 3a53 2830 2c31 2900 732d 3032 2f65 6874 6162 6c65 2e63 0074 6162 6c65 5f64 796e 616d 6963 3a53
4315520 2830 2c31 3529 0065 685f 6d61 6b65 5f65 7863 6570 7469 6f6e 3a46 2830 2c31 2900 666f 726d 6174 3a70 2834 2c32 2900 706e
4315600 6f64 653a 2830 2c31 3629 3d2a 2830 2c31 3529 0065 7863 6570 7469 6f6e 3a28 302c 3129 0065 685f 6d61 6b65 5f74 6162 6c65
4315660 5f6e 6f64 653a 6628 302c 3135 2900 6578 6365 7074 696f 6e3a 7028 302c 3129 0066 6f72 6d61 743a 7028 342c 3229 006e 6f64
4315740 653a 2830 2c31 3529 0065 685f 6765 745f 6578 6365 7074 696f 6e5f 666f 726d 6174 3a46 2834 2c32 2900 6578 6365 7074 696f
4316020 6e3a 7028 302c 3129 006e 6f64 653a 2830 2c31 3529 0066 6f72 6d61 743a 2834 2c32 2900 6d61 2e6f 005f 7665 7269 6679 5f61
4316100 6c6c 5f67 726f 7570 7300 5f67 726f 7570 5f69 735f 696e 5f67 726f 7570 5f6c 6973 7400 5f6d 615f 6d65 6d6f 7279 5f73 7461
4316160 7274 005f 6568 5f69 6400 5f76 6572 6966 795f 6772 6f75 705f 7374 6163 6b00 5f64 6566 6175 6c74 5f67 726f 7570 5f73 7472
4316240 7563 7400 5f6d 615f 636c 6561 6e5f 6d65 6d00 5f6d 615f 6964 005f 6d6c 5f69 6400 5f6d 615f 696e 745f 6964 005f 6375 7272
4316320 5f67 726f 7570 005f 6672 6565 5f67 726f 7570 5f6d 656d 6f72 7900 5f76 6572 6966 795f 6772 6f75 7000 5f66 7265 6567 726f
4316400 7570 7300 5f6d 615f 6d65 6d6f 7279 5f65 6e64 005f 6d61 5f63 6865 636b 5f66 7265 6500 5f6d 615f 6672 6565 5f67 726f 7570
4316460 005f 6772 6f75 705f 6c69 7374 005f 7374 6163 6b5f 7074 7200 5f66 6f6f 005f 6d61 6b65 5f6d 656d 6f72 795f 6772 6f75 7000
4316540 5f72 6373 5f69 6400 5f76 6572 6966 795f 6772 6f75 705f 7374 6163 6b5f 6772 6f75 7000 5f67 726f 7570 5f73 7461 636b 005f
4316620 7265 6d6f 7665 5f67 726f 7570 5f66 726f 6d5f 6772 6f75 705f 6c69 7374 002f 686f 6d65 2f66 7331 302f 622f 746f 6f6c 6c69
4316700 622f 7265 6c31 3330 2f00 732d 3033 2f6d 612e 6300 696e 743a 7428 302c 3129 3d72 2830 2c31 293b 2d32 3134 3734 3833 3634
4316760 383b 3231 3437 3438 3336 3437 3b00 6368 6172 3a74 2830 2c32 293d 7228 302c 3229 3b30 3b31 3237 3b00 6c6f 6e67 3a74 2830
4317040 2c33 293d 7228 302c 3129 3b2d 3231 3437 3438 3336 3438 3b32 3134 3734 3833 3634 373b 0073 686f 7274 3a74 2830 2c34 293d
4317120 7228 302c 3129 3b2d 3332 3736 383b 3332 3736 373b 0075 6e73 6967 6e65 6420 6368 6172 3a74 2830 2c35 293d 7228 302c 3129
4317200 3b30 3b32 3535 3b00 756e 7369 676e 6564 2073 686f 7274 3a74 2830 2c36 293d 7228 302c 3129 3b30 3b36 3535 3335 3b00 756e
4317260 7369 676e 6564 206c 6f6e 673a 7428 302c 3729 3d72 2830 2c31 293b 303b 2d31 3b00 756e 7369 676e 6564 2069 6e74 3a74 2830
4317340 2c38 293d 7228 302c 3129 3b30 3b2d 313b 0066 6c6f 6174 3a74 2830 2c39 293d 7228 302c 3129 3b34 3b30 3b00 646f 7562 6c65
4317420 3a74 2830 2c31 3029 3d72 2830 2c31 293b 383b 303b 0076 6f69 643a 7428 302c 3131 293d 2830 2c31 3129 003f 3f3f 3a74 2830
4317500 2c31 3229 3d28 302c 3129 0072 6373 5f69 643a 5328 302c 3133 293d 6172 2830 2c31 293b 303b 3636 3b28 302c 3229 0069 6e63
4317560 6c75 6465 2f6d 6c2e 6800 696e 636c 7564 652f 646c 2e68 006d 6c5f 6964 3a53 2830 2c31 3329 0069 6e63 6c75 6465 2f65 682e
4317640 6800 696e 636c 7564 652f 6568 2e68 0065 685f 6964 3a53 2830 2c31 3329 0065 685f 6578 6365 7074 696f 6e3a 7428 302c 3129
4317720 0062 6f6f 6c65 616e 3a74 2830 2c31 2900 732d 3033 2f6d 612e 6800 732d 3033 2f6d 612e 6800 6d61 5f69 643a 5328 302c 3133
4320000 2900 706f 696e 7465 723a 7428 332c 3129 3d2a 2833 2c32 293d 6172 2830 2c31 293b 303b 303b 2833 2c33 293d 6172 2830 2c31
4320060 293b 303b 303b 2833 2c34 293d 6172 2830 2c31 293b 303b 303b 2833 2c35 293d 6172 2830 2c31 293b 303b 303b 2833 2c36 293d
4320140 6172 2830 2c31 293b 303b 303b 2833 2c37 293d 6172 2830 2c31 293b 303b 303b 2830 2c32 2900 6d61 5f67 726f 7570 3a74 2833
4320220 2c38 293d 2a28 332c 3929 3d73 346d 615f 6772 6f75 703a 2830 2c31 292c 302c 3332 3b3b 0066 756e 6374 696f 6e3a 7428 332c
4320300 3130 293d 2a28 332c 3131 293d 6628 302c 3129 0073 2d30 332f 6d61 5f69 6e74 2e68 0073 2d30 332f 6d61 5f69 6e74 2e68 006d
4320360 615f 696e 745f 6964 3a53 2834 2c31 293d 6172 2830 2c31 293b 303b 3730 3b28 302c 3229 006d 615f 6d65 6d5f 626c 6f63 6b3a
4320440 7428 342c 3329 3d2a 2834 2c32 293d 7873 6d61 5f6d 656d 5f62 6c6f 636b 5f73 7472 7563 743a 006d 615f 6772 6f75 705f 696e
4320520 743a 7428 342c 3529 3d2a 2834 2c34 293d 7873 6d61 5f6d 656d 6770 5f73 7472 7563 743a 0066 7265 655f 626c 6f63 6b5f 6461
4320600 7461 3a74 2834 2c37 293d 2a28 342c 3629 3d78 7366 7265 655f 626c 6f63 6b5f 6461 7461 5f73 7472 7563 743a 0066 7265 655f
4320660 6c69 7374 5f64 6174 613a 7428 342c 3929 3d2a 2834 2c38 293d 7873 6672 6565 5f6c 6973 745f 6461 7461 5f73 7472 7563 743a
4320740 0066 7265 655f 626c 6f63 6b5f 6461 7461 5f73 7472 7563 743a 5428 342c 3629 3373 3873 697a 653a 2830 2c38 292c 302c 3332
4321020 3b6e 6578 743a 2834 2c31 3029 3d2a 2834 2c36 292c 3332 2c33 323b 3b00 6672 6565 5f6c 6973 745f 6461 7461 5f73 7472 7563
4321100 743a 5428 342c 3829 3d73 3430 3473 6d61 6c6c 5f62 6c6f 636b 733a 2834 2c31 3129 3d61 7228 302c 3129 3b30 3b39 393b 2834
4321160 2c31 3029 2c30 2c33 3230 303b 6269 675f 626c 6f63 6b73 3a28 342c 3130 292c 3332 3030 2c33 323b 3b00 6d61 5f6d 656d 6770
4321240 5f73 7472 7563 743a 5428 342c 3429 3d73 3732 6265 6769 6e5f 6d61 6769 633a 2830 2c31 292c 302c 3332 3b6e 6578 743a 2834
4321320 2c31 3229 3d2a 2834 2c34 292c 3332 2c33 323b 706c 6173 743a 2834 2c31 3329 3d2a 2834 2c31 3229 2c36 342c 3332 3b63 6869
4321400 6c64 7265 6e3a 2834 2c31 3229 2c39 362c 3332 3b73 7562 5f6e 6578 743a 2834 2c31 3229 2c31 3238 2c33 323b 7073 7562 5f6c
4321460 6173 743a 2834 2c31 3329 2c31 3630 2c33 323b 6375 7272 656e 745f 626c 6f63 6b3a 2834 2c33 292c 3139 322c 3332 3b62 6c6f
4321540 636b 5f70 7472 3a28 332c 3129 2c32 3234 2c33 323b 5c00 626c 6f63 6b5f 6d65 6d5f 6c65 6674 3a28 302c 3129 2c32 3536 2c33
4321620 323b 626c 6f63 6b5f 7369 7a65 3a28 302c 3129 2c32 3838 2c33 323b 6d65 6d5f 7573 6564 3a28 302c 3129 2c33 3230 2c33 323b
4321700 7061 645f 6c69 7374 3a28 332c 3129 2c33 3532 2c33 323b 6672 6565 5f6c 6973 743a 2834 2c31 3429 3d2a 2834 2c38 292c 3338
4321760 342c 3332 3b70 7665 7269 6679 5f67 726f 7570 3a28 342c 3135 293d 2a28 342c 3136 293d 6628 332c 3129 2c34 3136 2c33 323b
4322040 7066 7265 653a 2834 2c31 3529 2c34 3438 2c33 323b 7061 6c6c 6f63 3a28 342c 3135 292c 3438 302c 3332 3b5c 006c 6162 656c
4322120 3a28 342c 3137 293d 2a28 302c 3229 2c35 3132 2c33 323b 656e 645f 6d61 6769 633a 2830 2c31 292c 3534 342c 3332 3b3b 006d
4322200 615f 6d65 6d5f 626c 6f63 6b5f 7374 7275 6374 3a54 2834 2c32 293d 7331 326e 6578 743a 2834 2c31 3829 3d2a 2834 2c32 292c
```

| | | | | | | | | | | | | | | | | | | | | | | | | |
|---|---|---|---|---|---|---|---|---|---|---|---|---|---|---|---|---|---|---|---|---|---|---|---|---|
| 4322260 | 302c | 3332 | 3b73 | 697a | 653a | 2830 | 2c38 | 292c | 3332 | 2c33 | 323b | 6d65 | 6d6f | 7279 | 3a2d | 302c | 3129 | 2c36 | 342c | 3332 | 3b3b | 006d | 615f | 6770 |
| 4322340 | 5f66 | 696c | 6c5f | 666c | 6167 | 3a47 | 2830 | 2c31 | 2900 | 6d61 | 5f67 | 705f | 7061 | 645f | 666c | 6167 | 3a47 | 2830 | 2c31 | 2900 | 6d61 | 5f73 | 7065 | 6369 |
| 4322420 | 616c | 5f66 | 6c61 | 673a | 4728 | 302c | 3129 | 0066 | 7265 | 6567 | 726f | 7570 | 733a | 5328 | 342c | 3132 | 2900 | 732d | 3033 | 2f6d | 612e | 6300 | 6d61 | 5f72 |
| 4322500 | 6574 | 7279 | 5f61 | 6c6c | 6f63 | 3a47 | 2830 | 2c31 | 2900 | 6461 | 5f6d | 656d | 5f61 | 6c6c | 6f63 | 6174 | 6564 | 3a47 | 2830 | 2c31 | 2900 | 6d61 | 5f6d | 656d |
| 4322560 | 6f72 | 795f | 7374 | 6172 | 743a | 5328 | 332c | 3129 | 006d | 615f | 6d65 | 6d6f | 7279 | 5f65 | 6e64 | 3a53 | 2833 | 2c31 | 2900 | 6d61 | 5f63 | 6865 | 636b | 5f66 |
| 4322640 | 7265 | 653a | 5328 | 302c | 3129 | 0066 | 6f6f | 3a53 | 2834 | 2c38 | 2900 | 6465 | 6661 | 756c | 745f | 6772 | 6f75 | 705f | 7374 | 7275 | 6374 | 3a53 | 2834 | 2c34 |
| 4322720 | 2900 | 6772 | 6f75 | 705f | 6c69 | 7374 | 3a53 | 2834 | 2c31 | 3229 | 0063 | 7572 | 725f | 6772 | 6f75 | 703a | 5328 | 342c | 3132 | 2900 | 7374 | 6163 | 6b5f | 7074 |
| 4323000 | 723a | 5328 | 302c | 3129 | 0067 | 726f | 7570 | 5f73 | 7461 | 636b | 3a53 | 2830 | 2c31 | 3429 | 3d61 | 7228 | 302c | 3129 | 3b30 | 3b33 | 3939 | 393b | 2834 | 2c31 |
| 4323060 | 3229 | 006d | 615f | 626c | 6b66 | 696c | 6c3a | 4628 | 302c | 3131 | 2900 | 703a | 7028 | 332c | 3129 | 0073 | 697a | 653a | 7028 | 302c | 3829 | 0063 | 3a70 | 2830 |
| 4323140 | 2c32 | 2900 | 7369 | 7a65 | 3a72 | 2830 | 2c38 | 2900 | 7374 | 6172 | 743a | 7228 | 342c | 3137 | 2900 | 6363 | 6363 | 3a28 | 302c | 3129 | 006d | 615f | 6765 | 745f |
| 4323220 | 6d65 | 6d6f | 7279 | 5f75 | 7365 | 643a | 4628 | 302c | 3129 | 006d | 615f | 6973 | 5f70 | 6f69 | 6e74 | 6572 | 3a46 | 2830 | 2c31 | 2900 | 703a | 7028 | 332c | 3129 |
| 4323300 | 006d | 615f | 636f | 756e | 745f | 6772 | 6f75 | 703a | 4628 | 302c | 3129 | 0067 | 726f | 7570 | 3a72 | 2834 | 2c31 | 3229 | 0063 | 6f75 | 6e74 | 3a28 | 302c | 3129 |
| 4323360 | 006d | 615f | 6973 | 5f70 | 6f69 | 6e74 | 6572 | 5f69 | 6e5f | 6772 | 6f75 | 703a | 4628 | 302c | 3129 | 0070 | 3a70 | 2833 | 2c31 | 2900 | 6772 | 6f75 | 703a | 7028 |
| 4323440 | 332c | 3829 | 0070 | 3a72 | 2833 | 2c31 | 2900 | 626c | 6f63 | 6b3a | 7228 | 342c | 3138 | 2900 | 6d61 | 5f63 | 7572 | 7265 | 6e74 | 5f67 | 726f | 7570 | 3a46 | 2833 |
| 4323520 | 2c38 | 2900 | 6d61 | 5f64 | 6566 | 6175 | 6c74 | 5f67 | 726f | 7570 | 3a46 | 2833 | 2c38 | 2900 | 6d61 | 5f70 | 7573 | 685f | 6772 | 6f75 | 703a | 4628 | 302c | 3131 |
| 4323600 | 2900 | 6772 | 6f75 | 703a | 7028 | 332c | 3829 | 006d | 615f | 706f | 705f | 6772 | 6f75 | 703a | 4628 | 332c | 3829 | 0074 | 656d | 703a | 2834 | 2c31 | 3229 | 006d |
| 4323660 | 615f | 6d61 | 6b65 | 5f6e | 5f70 | 7573 | 683a | 4628 | 302c | 3131 | 2900 | 7061 | 726d | 733a | 7028 | 302c | 3129 | 0062 | 6c6f | 636b | 5f73 | 697a | 653a | 7028 |
| 4323740 | 302c | 3129 | 0072 | 6574 | 3a28 | 342c | 3132 | 2900 | 6d61 | 6b65 | 5f6d | 656d | 6f72 | 795f | 6772 | 6f75 | 703a | 6628 | 302c | 3129 | 0070 | 6772 | 6f75 | 703a |
| 4324020 | 7028 | 342c | 3133 | 2900 | 7061 | 726d | 733a | 7028 | 302c | 3129 | 0070 | 6172 | 656e | 745f | 6772 | 6f75 | 703a | 7028 | 342c | 3132 | 2900 | 626c | 6f63 | 6b5f |
| 4324100 | 7369 | 7a65 | 3a70 | 2830 | 2c31 | 2900 | 6461 | 5f70 | 6f70 | 5f6e | 5f66 | 7265 | 653a | 4628 | 302c | 3131 | 2900 | 6d61 | 5f66 | 7265 | 655f | 6772 | 6f75 | 703a |
| 4324160 | 6628 | 302c | 3129 | 0067 | 726f | 7570 | 3a70 | 2833 | 2c38 | 2900 | 6672 | 6565 | 5f67 | 726f | 7570 | 5f6d | 656d | 6f72 | 793a | 6628 | 302c | 3129 | 0067 | 726f |
| 4324240 | 7570 | 3a70 | 2834 | 2c31 | 3229 | 0062 | 6c6f | 636b | 3a28 | 342c | 3138 | 2900 | 6e65 | 7874 | 3a28 | 342c | 3138 | 2900 | 7265 | 616f | 7665 | 5f67 | 726f | 7570 |
| 4324320 | 5f66 | 726f | 6d5f | 6772 | 6f75 | 705f | 6c69 | 7374 | 3a66 | 2830 | 2c31 | 2900 | 6772 | 6f75 | 703a | 7028 | 342c | 3132 | 2900 | 7067 | 726f | 7570 | 3a28 | 342c |
| 4324400 | 3133 | 2900 | 6d61 | 5f7a | 616c | 6c6f | 633a | 4628 | 332c | 3129 | 0073 | 697a | 653a | 7028 | 302c | 3829 | 0073 | 697a | 653a | 7228 | 302c | 3829 | 0070 | 3a28 |
| 4324460 | 332c | 3129 | 0069 | 703a | 7228 | 302c | 3135 | 293d | 2a28 | 302c | 3129 | 006d | 615f | 616c | 6c6f | 633a | 4628 | 332c | 3129 | 0073 | 697a | 653a | 7028 | 302c |
| 4324540 | 3829 | 006d | 615f | 6672 | 6565 | 3a46 | 2830 | 2c31 | 3129 | 0070 | 3a70 | 2833 | 2c31 | 2900 | 6d61 | 5f73 | 7973 | 7465 | 6d5f | 616c | 6c6f | 633a | 4628 | 332c |
| 4324620 | 3129 | 0073 | 697a | 653a | 7028 | 302c | 3829 | 0072 | 6574 | 3a28 | 332c | 3129 | 0065 | 6e64 | 3a28 | 332c | 3129 | 006d | 615f | 636c | 6561 | 6e5f | 6d65 | 6d3a |
| 4324700 | 6628 | 302c | 3129 | 006d | 656d | 3a70 | 2833 | 2c31 | 2900 | 7369 | 7a65 | 3a70 | 2830 | 2c38 | 2900 | 6d61 | 5f74 | 7572 | 6e5f | 6f6e | 5f66 | 696c | 6c3a | 4628 |
| 4324760 | 302c | 3131 | 2900 | 6d61 | 5f74 | 7572 | 6e5f | 6f6e | 5f70 | 6164 | 3a46 | 2830 | 2c31 | 3129 | 006d | 615f | 7665 | 7269 | 6679 | 3a46 | 2830 | 2c31 | 3129 | 0076 |
| 4325040 | 6572 | 6966 | 795f | 6772 | 6f75 | 705f | 7374 | 6163 | 6b3a | 6628 | 302c | 3129 | 0069 | 3a28 | 302c | 3129 | 0067 | 726f | 7570 | 3a28 | 342c | 3132 | 2900 | 7665 |
| 4325120 | 7269 | 6679 | 5f67 | 726f | 7570 | 5f73 | 7461 | 636b | 5f67 | 726f | 7570 | 3a66 | 2830 | 2c31 | 2900 | 6772 | 6f75 | 703a | 7028 | 342c | 3132 | 2900 | 6772 | 6f75 |
| 4325200 | 705f | 6973 | 5f69 | 6e5f | 6772 | 6f75 | 705f | 6c69 | 7374 | 3a66 | 2830 | 2c31 | 2900 | 6772 | 6f75 | 703a | 7028 | 342c | 3132 | 2900 | 673a | 2834 | 2c31 | 3229 |
| 4325260 | 0076 | 6572 | 6966 | 795f | 616c | 6c5f | 6772 | 6f75 | 7073 | 3a66 | 2830 | 2c31 | 2900 | 6772 | 6f75 | 703a | 2834 | 2c31 | 3229 | 006d | 615f | 6973 | 5f67 | 726f |
| 4325340 | 7570 | 3a46 | 2830 | 2c31 | 2900 | 6772 | 6f75 | 703a | 7028 | 332c | 3829 | 006d | 615f | 7665 | 7269 | 6679 | 5f67 | 726f | 7570 | 3a46 | 2830 | 2c31 | 3129 | 0067 |
| 4325420 | 726f | 7570 | 3a70 | 2833 | 2c38 | 2900 | 7665 | 7269 | 6679 | 5f67 | 726f | 7570 | 3a66 | 2830 | 2c31 | 2900 | 6772 | 6f75 | 703a | 7028 | 342c | 3132 | 2900 | 6d61 |
| 4325500 | 5f67 | 6574 | 5f67 | 726f | 7570 | 5f6d | 656d | 6f72 | 795f | 7573 | 6564 | 3a46 | 2830 | 2c31 | 2900 | 6772 | 6f75 | 703a | 7028 | 332c | 3829 | 006d | 615f | 6765 |
| 4325560 | 745f | 6e65 | 7874 | 5f67 | 726f | 7570 | 3a46 | 2833 | 2c38 | 2900 | 6772 | 6f75 | 703a | 7028 | 332c | 3829 | 006d | 615f | 7375 | 6d3a | 4628 | 302c | 3129 | 0076 |
| 4325640 | 616c | 6675 | 6e63 | 3a70 | 2833 | 2c31 | 3029 | 0067 | 3a28 | 342c | 3132 | 2900 | 7375 | 6d3a | 2830 | 2c31 | 2900 | 6d61 | 5f63 | 6f6d | 7061 | 7265 | 5f70 | 6f69 |
| 4325720 | 6e74 | 6572 | 3a46 | 2830 | 2c31 | 2900 | 7031 | 3a70 | 2833 | 2c31 | 2900 | 7032 | 3a70 | 2833 | 2c31 | 2900 | 6d61 | 5f68 | 6173 | 685f | 706f | 696e | 7465 | 723a |
| 4326000 | 4628 | 302c | 3129 | 0070 | 3a70 | 2833 | 2c31 | 2900 | 7265 | 743a | 7228 | 302c | 3129 | 006d | 615f | 7365 | 745f | 6772 | 6f75 | 705f | 6c61 | 6265 | 6c3a | 4628 |
| 4326060 | 302c | 3131 | 2900 | 7061 | 7373 | 6564 | 5f67 | 726f | 7570 | 3a70 | 2833 | 2c38 | 2900 | 6c61 | 6265 | 6c3a | 7028 | 342c | 3137 | 2900 | 6c65 | 6e67 | 7468 | 3a28 |
| 4326140 | 302c | 3129 | 0070 | 7472 | 3a28 | 342c | 3137 | 2900 | 6772 | 6f75 | 703a | 2834 | 2c31 | 3229 | 006d | 615f | 6765 | 745f | 6772 | 6f75 | 705f | 6c61 | 6265 | 6c3a |
| 4326220 | 4628 | 342c | 3137 | 2900 | 6772 | 6f75 | 703a | 7028 | 332c | 3829 | 006d | 615f | 7475 | 726e | 5f6f | 6e5f | 6672 | 6565 | 5f63 | 6865 | 636b | 3a46 | 2830 | 2c31 |
| 4326300 | 3129 | 006d | 615f | 7475 | 726e | 5f6f | 6666 | 5f66 | 7265 | 655f | 6368 | 6563 | 6b3a | 4628 | 302c | 3131 | 2900 | 6d61 | 6e66 | 2e6f | 005f | 6765 | 745f | 6d6f |
| 4326360 | 7265 | 5f6d | 656d | 6f72 | 7900 | 5f66 | 696c | 6c5f | 7061 | 6400 | 5f65 | 685f | 6964 | 005f | 6d61 | 5f69 | 6400 | 5f6d | 6c5f | 6964 | 005f | 6d61 | 5f69 | 6e74 |
| 4326440 | 5f69 | 6400 | 5f72 | 6373 | 5f69 | 6400 | 2f68 | 6f6d | 652f | 6673 | 3130 | 2f62 | 2f74 | 6f6f | 6c6c | 6962 | 2f72 | 656c | 3130 | 302f | 0073 | 2d30 | 332f | 6d61 |
| 4326520 | 6e66 | 2e63 | 0069 | 6e74 | 3a74 | 2830 | 2c31 | 293d | 7228 | 302c | 3129 | 3b2d | 3231 | 3437 | 3438 | 3336 | 3438 | 3b32 | 3134 | 3734 | 3833 | 3634 | 373b | 0063 |
| 4326600 | 6861 | 723a | 7428 | 302c | 3229 | 3d72 | 2830 | 2c32 | 293b | 303b | 3132 | 373b | 006c | 6f6e | 673a | 7428 | 302c | 3329 | 3d72 | 2830 | 2c31 | 293b | 2d32 | 3134 |
| 4326660 | 3734 | 3833 | 3634 | 383b | 3231 | 3437 | 3438 | 3336 | 3437 | 3b00 | 7368 | 6f72 | 743a | 7428 | 302c | 3429 | 3d72 | 2830 | 2c31 | 293b | 2d33 | 3237 | 3638 | 3b33 |
| 4326740 | 3237 | 3637 | 3b00 | 756e | 7369 | 676e | 6564 | 2063 | 6861 | 723a | 7428 | 302c | 3529 | 3d72 | 2830 | 2c31 | 293b | 303b | 3235 | 353b | 0075 | 6e73 | 6967 | 6e65 |
| 4327020 | 6420 | 7368 | 6f72 | 743a | 7428 | 302c | 3629 | 3d72 | 2830 | 2c31 | 293b | 303b | 3635 | 3533 | 353b | 0075 | 6e73 | 6967 | 6e65 | 6420 | 6c6f | 6e67 | 3a74 | 2830 |
| 4327100 | 2c37 | 293d | 7228 | 302c | 3129 | 3b30 | 3b2d | 313b | 0075 | 6e73 | 6967 | 6e65 | 6420 | 696e | 743a | 7428 | 302c | 3829 | 3172 | 2830 | 2c31 | 293b | 303b | 2d31 |
| 4327160 | 3b00 | 666c | 6f61 | 743a | 7428 | 302c | 3929 | 3d72 | 2830 | 2c31 | 293b | 343b | 303b | 0064 | 6f75 | 626c | 653a | 7428 | 302c | 3130 | 293d | 7228 | 302c | 3129 |
| 4327240 | 3b38 | 3b30 | 3b00 | 766f | 6964 | 3a74 | 2830 | 2c31 | 3129 | 3d28 | 302c | 3131 | 2900 | 3f3f | 3f3a | 7428 | 302c | 3132 | 293d | 2830 | 2c31 | 2900 | 7263 | 735f |
| 4327320 | 6964 | 3a53 | 2833 | 2c31 | 3329 | 3d61 | 7228 | 302c | 3129 | 3b30 | 3b36 | 383b | 2830 | 2c32 | 2900 | 696e | 636c | 7564 | 652f | 6d6c | 2e68 | 0069 | 6e63 | 6c75 |

```
4327400  6465 2f61 6c2e 6400 6d6c 5f69 643a 5328 312c 3129 3d61 7228 302c 3129 3b30 3b36 363b 2830 2c32 2900 696e 636c 7564 652f
4327460  6568 2e68 0069 6e63 6c75 6465 2f65 682e 6800 6568 5f69 643a 5328 312c 3129 0065 685f 6578 6365 7074 696f 6e3a 7428 302c
4327540  3129 0062 6f6f 6c65 616e 3a74 2830 2c31 2900 732d 3033 2f6d 612e 6800 732d 3033 2f6d 612e 6800 6d61 5f69 643a 5328 312c
4327620  3129 0070 6f69 6e74 6572 3a74 2833 2c31 293d 2a28 332c 3229 3d61 7228 302c 3129 3b30 3b30 3b28 332c 3329 3d61 7228 302c
4327700  3129 3b30 3b30 3b28 332c 3429 3d61 7228 302c 3129 3b30 3b30 3b28 332c 3529 3d61 7228 302c 3129 3b30 3b30 3b28 332c 3629
4327760  3d61 7228 302c 3129 3b30 3b30 3b28 332c 3729 3d61 7228 302c 3129 3b30 3b30 3b28 302c 3229 006d 615f 6772 6f75 703a 7428
4330040  332c 3829 3d2a 2833 2c39 293d 7334 6d61 5f67 726f 7570 3a28 302c 3129 2c30 2c33 323b 3b00 6675 6e63 7469 6f6e 3a74 2833
4330120  2c31 3029 3d2a 2833 2c31 3129 3d66 2830 2c31 2900 732d 3033 2f6d 615f 696e 742e 6800 732d 3033 2f6d 615f 696e 742e 6800
4330200  6d61 5f69 6e74 5f69 643a 5328 342c 3129 3d61 7228 302c 3129 3b30 3b37 303b 2830 2c32 2900 6d61 5f6d 656d 5f62 6c6f 636b
4330260  3a74 2834 2c33 293d 2a28 342c 3229 3d78 736d 615f 6d65 6d5f 626c 6f63 6b5f 7374 7275 6374 3a00 6d61 5f67 726f 7570 5f69
4330340  6e74 3a74 2834 2c35 293d 2a28 342c 3429 3d78 736d 615f 6d65 6d67 705f 7374 7275 6374 3a00 6672 6565 5f62 6c6f 636b 5f64
4330420  6174 613a 7428 342c 3729 3d2a 2834 2c36 293d 7873 6672 6565 5f62 6c6f 636b 5f64 6174 615f 7374 7275 6374 3a00 6672 6565
4330500  5f6c 6973 745f 6461 7461 3a74 2834 2c39 293d 2a28 342c 3829 3d78 7366 7265 655f 6c69 7374 5f64 6174 615f 7374 7275 6374
4330560  3a00 6672 6565 5f62 6c6f 636b 5f64 6174 615f 7374 7275 6374 3a54 2834 2c36 293d 7338 7369 7a65 3a28 302c 3829 2c30 2c33
4330640  323b 6e65 7874 3a28 342c 3130 293d 2a28 342c 3629 2c33 322c 3332 3b3b 0066 7265 655f 6c69 7374 5f64 6174 615f 7374 7275
4330720  6374 3a54 2834 2c38 293d 7334 3034 736d 616c 6c5f 626c 6f63 6b73 3a28 342c 3131 293d 6172 2830 2c31 293b 303b 3939 3b28
4331000  342c 3130 292c 302c 3332 3030 3b62 6967 5f62 6c6f 636b 733a 2834 2c31 3029 2c33 3230 302c 3332 3b3b 006d 615f 6d65 6d67
4331060  705f 7374 7275 6374 3a54 2834 2c34 293d 7337 3262 6567 696e 5f6d 6167 6963 3a28 302c 3129 2c30 2c33 323b 6e65 7874 3a28
4331140  342c 3132 293d 2a28 342c 3429 2c33 322c 3332 3b70 6c61 7374 3a28 342c 3133 293d 2a28 342c 3132 292c 3634 2c33 323b 6368
4331220  696c 6472 656e 3a28 342c 3132 292c 3936 2c33 323b 7375 625f 6e65 7874 3a28 342c 3132 292c 3132 382c 3332 3b70 7375 625f
4331300  6c61 7374 3a28 342c 3133 292c 3136 302c 3332 3b63 7572 7265 6e74 5f62 6c6f 636b 3a28 342c 3329 2c31 3932 2c33 323b 626c
4331360  6f63 6b5f 7074 723a 2833 2c31 292c 3232 342c 3332 3b5c 0062 6c6f 636b 5f6d 656d 5f6c 6566 743a 2830 2c31 292c 3235 362c
4331440  3332 3b62 6c6f 636b 5f73 697a 653a 2830 2c31 292c 3238 382c 3332 3b61 656d 5f75 7365 643a 2830 2c31 292c 3332 302c 3332
4331520  3b70 6164 5f6c 6973 743a 2833 2c31 292c 3335 322c 3332 3b66 7265 655f 6c69 7374 3a28 342c 3134 293d 2a28 342c 3829 2c33
4331600  3834 2c33 323b 7076 6572 6966 795f 6772 6f75 703a 2834 2c31 3529 3d2a 2834 2c31 3629 3d66 2833 2c31 292c 3431 362c 3332
4331660  3b70 6672 6565 3a28 342c 3135 292c 3434 382c 3332 3b70 616c 6c6f 633a 2834 2c31 3529 2c34 3830 2c33 323b 5c00 6c61 6265
4331740  6c3a 2834 2c31 3729 3d2a 2830 2c32 292c 3531 322c 3332 3b65 6e64 5f6d 6167 6963 3a28 302c 3129 2c35 3434 2c33 323b 3b00
4332020  6d61 5f6d 656d 5f62 6c6f 636b 5f73 7472 7563 743a 5428 342c 3229 3d73 3132 6e65 7874 3a28 342c 3138 293d 2a28 342c 3229
4332100  2c30 2c33 323b 7369 7a65 3a28 302c 3829 2c33 322c 3332 3b6d 656d 6f72 793a 2830 2c31 292c 3634 2c33 323b 3b00 6d61 5f67
4332160  705f 6669 6c6c 5f66 6c61 673a 4728 302c 3129 006d 615f 6770 5f70 6164 5f66 6c61 673a 4728 302c 3129 006d 615f 7370 6563
4332240  6961 6c5f 666c 6167 3a47 2830 2c31 2900 7061 645f 6461 7461 3a74 2830 2c31 3529 3d2a 2830 2c31 3429 3d78 7370 6164 5f64
4332320  6174 615f 7374 7275 6374 3a00 7061 645f 6461 7461 5f73 7472 7563 743a 5428 302c 3134 293d 7331 3262 6567 696e 5f6d 6167
4332400  6963 3a28 302c 3129 2c30 2c33 323b 6e65 7874 3a28 302c 3136 293d 2a28 302c 3134 292c 3332 2c33 323b 656e 645f 6d61 6769
4332460  633a 2830 2c31 292c 3634 2c33 323b 3b00 6d61 5f69 6e69 7469 616c 697a 655f 6772 6f75 705f 666f 725f 6e6f 5f66 7265 653a
4332540  4628 302c 3131 2900 6772 6f75 703a 7028 342c 3132 2900 732d 3033 2f6d 616e 662e 6300 6d61 5f6e 6661 6c6c 6f63 3a46 2833
4332620  2c31 2900 7369 7a65 3a70 2830 2c38 2900 6772 6f75 703a 7028 342c 3132 2900 7369 7a65 3a72 2830 2c38 2900 6772 6f75 703a
4332700  7228 342c 3132 2900 6f6c 645f 7369 7a65 3a28 302c 3829 0072 6574 3a28 332c 3129 0067 6574 5f6d 6f72 655f 6d65 6d6f 7279
4332760  3a66 2830 2c31 2900 7369 7a65 3a70 2830 2c38 2900 6772 6f75 703a 7028 342c 3132 2900 626c 6f63 6b3a 2834 2c31 3829 0073
4333040  697a 655f 746f 5f67 6574 3a28 302c 3829 0073 697a 655f 746f 5f61 6c6c 6f63 3a28 302c 3829 006d 615f 6e66 6672 6565 3a46
4333120  2833 2c31 2900 703a 7028 332c 3129 0067 726f 7570 3a70 2834 2c31 3229 0066 696c 6c5f 7061 643a 6628 302c 3129 0070 6164
4333200  3a70 2830 2c31 3629 0067 726f 7570 3a70 2834 2c31 3229 006d 615f 6e66 7665 7269 6679 5f67 726f 7570 3a46 2833 2c31 2900
4333260  6772 6f75 703a 7028 342c 3132 2900 7061 643a 2830 2c31 3629 006d 6167 662e 6f00 5f76 6572 6966 795f 736d 616c 6c5f 6672
4333340  6565 5f62 6c6f 636b 5f6c 6973 7400 5f69 6e73 6572 745f 696e 746f 5f62 6c6f 636b 5f6c 6973 7400 5f67 6574 5f6d 6f72 655f
4333420  6d65 6d6f 7279 005f 7665 7269 6679 5f62 6967 5f66 7265 655f 626c 6f63 6b00 5f67 6574 5f6d 656d 6f72 795f 6672 6f6d 5f62
4333500  6967 5f62 6c6f 636b 7300 5f65 6d5f 6964 005f 6361 6b65 5f70 6164 005f 6d61 5f69 6400 5f6d 6c5f 6964 005f 7665 7269 6679
4333560  5f62 6967 5f66 7265 655f 626c 6f63 6b5f 6c69 7374 005f 7369 6d70 6c65 5f61 6c6c 6f63 005f 6161 5f69 6e74 5f69 6400 5f64
4333640  656c 6574 655f 7061 6400 5f61 6c6c 6f63 6174 655f 626c 6f63 6b00 5f76 6572 6966 795f 736d 616c 6c5f 6672 6565 5f62 6c6f
4333720  636b 005f 6765 745f 6d65 6d6f 7279 5f66 726f 6d5f 736d 616c 6c5f 626c 6f63 6b73 005f 7665 7269 6679 5f66 7265 655f 6c69
4334000  7374 005f 6765 745f 6e65 775f 6d65 6d6f 7279 005f 696e 7365 7274 5f66 7265 655f 626c 6f63 6b5f 696e 746f 5f66 7265 655f
4334060  6c69 7374 005f 7263 735f 6964 005f 6d61 6b65 5f66 7265 655f 6c69 7374 002f 686f 6d65 2f66 7331 302f 622f 746f 6f6c 6c69
4334140  622f 7265 6c31 3030 2f00 732d 3033 2f6d 6167 662e 6300 696e 743a 7428 302c 3129 3d72 2830 2c31 293b 2d32 3134 3734 3833
4334220  3634 383b 3231 3437 3438 3335 3437 3b00 6368 6172 3a74 2830 2c32 293d 7228 302c 3229 3b30 3b31 3237 3b00 6c6f 6e67 3a74
4334300  2830 2c33 293d 7228 302c 3129 3b2d 3231 3437 3438 3336 3439 3b32 3134 3734 3833 3634 373b 0073 686f 7274 3a74 2830 2c34
4334360  293d 7228 302c 3129 3b2d 3332 3736 383b 3332 3736 373b 0075 6e73 6967 6e65 6420 6368 6172 3a74 2830 2c35 293d 7228 302c
4334440  3129 3b30 3b32 3535 3b00 756e 7369 676e 6564 2073 686f 7274 3a74 2830 2c36 293d 7228 302c 3129 3b30 3b36 3535 3335 3b00
```

| | | | | | | | | | | | | | | | | | | | | | | | | |
|---|---|---|---|---|---|---|---|---|---|---|---|---|---|---|---|---|---|---|---|---|---|---|---|---|
| 4334520 | 756e | 7369 | 676e | 6564 | 206c | 6f6c | 673a | 7428 | 302c | 3729 | 3d72 | 2830 | 2c31 | 293b | 303b | 2d31 | 3b30 | 756e | 7369 | 676e | 6564 | 2069 | 6e74 | 3a74 |
| 4334600 | 2830 | 2c38 | 293d | 7228 | 302c | 3129 | 3b30 | 3b2d | 313b | 0066 | 6c6f | 6174 | 3a74 | 2830 | 2c39 | 293d | 7228 | 302c | 3129 | 3b34 | 3b30 | 3b00 | 646f | 7562 |
| 4334660 | 6c65 | 3a74 | 2830 | 2c31 | 3029 | 3d72 | 2830 | 2c31 | 293b | 383b | 303b | 0076 | 6f69 | 643a | 7428 | 302c | 3131 | 293d | 2830 | 2c31 | 3129 | 003f | 3f3f | 3a74 |
| 4334740 | 2830 | 2c31 | 3229 | 3128 | 302c | 3129 | 0072 | 6373 | 5f69 | 643a | 5328 | 302c | 3133 | 293d | 6172 | 2830 | 2c31 | 293b | 303b | 3638 | 3b28 | 302c | 3229 | 0069 |
| 4335020 | 6e63 | 6c75 | 6465 | 2f6d | 6c2e | 6800 | 696e | 636c | 7564 | 652f | 6d6c | 2e69 | 006d | 6c5f | 6964 | 3a53 | 2831 | 2c31 | 293d | 6172 | 2830 | 2c31 | 293b | 303b |
| 4335100 | 3636 | 3b28 | 302c | 3229 | 0069 | 6e63 | 6c75 | 6465 | 2f65 | 682e | 6800 | 696e | 636c | 7564 | 652f | 6568 | 2e69 | 0065 | 685f | 6964 | 3a53 | 2831 | 2c31 | 2900 |
| 4335160 | 6568 | 5f65 | 7863 | 6570 | 7469 | 6f6e | 3a74 | 2830 | 2c31 | 2900 | 626f | 6f6c | 6561 | 6e3a | 7428 | 302c | 3129 | 0073 | 2d30 | 332f | 6d61 | 2e68 | 0073 | 2d30 |
| 4335240 | 332f | 6d61 | 2e68 | 006d | 615f | 6964 | 3a53 | 2831 | 2c31 | 2900 | 706f | 696e | 7465 | 723a | 7428 | 332c | 3129 | 3d2a | 2833 | 2c32 | 293d | 6172 | 2830 | 2c31 |
| 4335320 | 293b | 303b | 303b | 2833 | 2c33 | 293d | 6172 | 2830 | 2c31 | 293b | 303b | 303b | 2833 | 2c34 | 293d | 6172 | 2830 | 2c31 | 293b | 303b | 303b | 2833 | 2c35 | 293d |
| 4335400 | 6172 | 2830 | 2c31 | 293b | 303b | 303b | 2833 | 2c36 | 293d | 6172 | 2830 | 2c31 | 293b | 303b | 303b | 2833 | 2c37 | 293d | 6172 | 2830 | 2c31 | 293b | 303b | 303b |
| 4335460 | 2830 | 2c32 | 2900 | 6d61 | 5f67 | 726f | 7570 | 3a74 | 2833 | 2c38 | 293d | 2a28 | 332c | 3929 | 3d73 | 346d | 615f | 6772 | 6f75 | 703a | 2830 | 2c31 | 292c | 302c |
| 4335540 | 3332 | 3b3b | 0066 | 756e | 6374 | 696f | 6e3a | 7428 | 332c | 3130 | 293d | 2a28 | 332c | 3131 | 293d | 6628 | 302c | 3129 | 0073 | 2d30 | 332f | 6d61 | 5f69 | 6e74 |
| 4335620 | 2e68 | 0073 | 2d30 | 332f | 6d61 | 5f69 | 6e74 | 2e68 | 0061 | 615f | 696e | 745f | 6964 | 3a53 | 2834 | 2c31 | 293d | 6172 | 2830 | 2c31 | 293b | 303b | 3730 | 3b28 |
| 4335700 | 302c | 3229 | 006d | 615f | 6d65 | 6d5f | 626c | 6f63 | 6b3a | 7428 | 342c | 3329 | 3d2a | 2834 | 2c32 | 293d | 7873 | 6d61 | 5f6d | 656d | 5f62 | 6c6f | 636b | 5f73 |
| 4335760 | 7472 | 7563 | 743a | 006d | 615f | 6772 | 6f75 | 705f | 696e | 743a | 7428 | 342c | 3529 | 3d2a | 2834 | 2c34 | 293d | 7873 | 6d61 | 5f6d | 656d | 6770 | 5f73 | 7472 |
| 4336040 | 7563 | 743a | 0066 | 7265 | 655f | 626c | 6f63 | 6b5f | 6461 | 7461 | 3a74 | 2834 | 2c37 | 293d | 2a29 | 342c | 3629 | 3d78 | 7366 | 7265 | 655f | 626c | 6f63 | 6b5f |
| 4336120 | 6461 | 7461 | 5f73 | 7472 | 7563 | 743a | 0066 | 7265 | 655f | 6c69 | 7374 | 5f64 | 6174 | 613a | 7428 | 342c | 3929 | 3d2a | 2834 | 2c38 | 293d | 7873 | 6672 | 6565 |
| 4336200 | 5f6c | 6973 | 745f | 6461 | 7461 | 5f73 | 7472 | 7563 | 743a | 0066 | 7265 | 655f | 626c | 6f63 | 6b5f | 6461 | 7461 | 5f73 | 7472 | 7563 | 743a | 5428 | 342c | 3629 |
| 4336260 | 3d73 | 3373 | 697a | 653a | 2830 | 2c38 | 292c | 302c | 3332 | 3b6e | 6578 | 743a | 2834 | 2c31 | 3029 | 3d2a | 2834 | 2c36 | 292c | 3332 | 2c33 | 323b | 3b00 | 6672 |
| 4336340 | 6565 | 5f6c | 6973 | 745f | 6461 | 7461 | 5f73 | 7472 | 7563 | 743a | 5428 | 342c | 3829 | 3d73 | 3430 | 3473 | 6d61 | 6c6c | 5f62 | 6c6f | 636b | 733a | 2834 | 2c31 |
| 4336420 | 3129 | 3d61 | 7228 | 302c | 3129 | 3b30 | 3b39 | 393b | 2834 | 2c31 | 3029 | 2c30 | 2c33 | 3230 | 303b | 6269 | 675f | 626c | 6f63 | 6b73 | 3a28 | 342c | 3130 | 292c |
| 4336500 | 3332 | 3030 | 2c33 | 323b | 3b00 | 6d61 | 5f6d | 656d | 6770 | 5f73 | 7472 | 7563 | 743a | 5429 | 342c | 3429 | 3d73 | 3732 | 6265 | 6769 | 6e5f | 6d61 | 6769 | 633a |
| 4336560 | 2830 | 2c31 | 292c | 332c | 3332 | 3b6e | 6578 | 743a | 2834 | 2c31 | 3229 | 3d2a | 2834 | 2c34 | 292c | 3332 | 2c33 | 323b | 706c | 6173 | 743a | 2834 | 2c31 | 3329 |
| 4336640 | 3d2a | 2834 | 2c31 | 3229 | 2c36 | 342c | 3332 | 3b63 | 6869 | 6c64 | 7265 | 6e3a | 2834 | 2c31 | 3229 | 2c39 | 362c | 3332 | 3b73 | 7562 | 5f6e | 6578 | 743a | 2834 |
| 4336720 | 2c31 | 3229 | 2c31 | 3238 | 2c33 | 323b | 7073 | 7562 | 5f6c | 6173 | 743a | 2834 | 2c31 | 3329 | 2c31 | 3630 | 2c33 | 323b | 6375 | 7272 | 656e | 745f | 626c | 6f63 |
| 4337000 | 6b3a | 2834 | 2c33 | 292c | 3139 | 322c | 3332 | 3b62 | 6c6f | 636b | 5f70 | 7472 | 3a28 | 332c | 3129 | 2c32 | 3234 | 2c33 | 323b | 5c00 | 626c | 6f63 | 6b5f | 6d65 |
| 4337060 | 6d5f | 6c65 | 6674 | 3a28 | 302c | 3129 | 2c32 | 3536 | 2c33 | 323b | 626c | 6f63 | 6b5f | 7369 | 7a65 | 3a28 | 302c | 3129 | 2c32 | 3838 | 2c33 | 323b | 6d65 | 6d5f |
| 4337140 | 7573 | 6564 | 3a28 | 302c | 3129 | 2c33 | 3230 | 2c33 | 323b | 7061 | 645f | 6c69 | 7374 | 3a28 | 332c | 3129 | 2c33 | 3532 | 2c33 | 323b | 6672 | 6565 | 5f6c | 6973 |
| 4337220 | 743a | 2834 | 2c31 | 3429 | 3d2a | 2834 | 2c38 | 292c | 3338 | 342c | 3332 | 3b70 | 7665 | 7269 | 6679 | 5f67 | 726f | 7570 | 3a28 | 342c | 3135 | 293d | 2a28 | 342c |
| 4337300 | 3136 | 293d | 6628 | 332c | 3129 | 2c34 | 3136 | 2c33 | 323b | 7066 | 7265 | 653a | 2834 | 2c31 | 3529 | 2c34 | 3438 | 2c33 | 323b | 7061 | 6c6c | 6f63 | 3a28 | 342c |
| 4337360 | 3135 | 292c | 3438 | 302c | 3332 | 3b5c | 006c | 6162 | 656c | 3a28 | 342c | 3137 | 293d | 2a28 | 302c | 3229 | 2c35 | 3132 | 2c33 | 323b | 656e | 645f | 6d61 | 6769 |
| 4337440 | 633a | 2830 | 2c31 | 292c | 3534 | 342c | 3332 | 3b3b | 006d | 615f | 6d65 | 6d5f | 626c | 6f63 | 6b5f | 7374 | 7275 | 6374 | 3a54 | 2834 | 2c32 | 293d | 7331 | 326e |
| 4337520 | 6578 | 743a | 2834 | 2c31 | 3829 | 3d2a | 2834 | 2c32 | 292c | 302c | 3332 | 3b73 | 697a | 653a | 2830 | 2c38 | 292c | 3332 | 2c33 | 323b | 6d65 | 6d6f | 7279 | 3a28 |
| 4337600 | 302c | 3129 | 2c36 | 342c | 3332 | 3b3b | 006d | 615f | 6770 | 5f66 | 696c | 6c5f | 666c | 6167 | 3a47 | 2830 | 2c31 | 2900 | 6461 | 5f67 | 705f | 7061 | 645f | 666c |
| 4337660 | 6167 | 3a47 | 2830 | 2c31 | 2900 | 6d61 | 5f73 | 7065 | 6369 | 616c | 5f66 | 6c61 | 673a | 4728 | 302c | 3129 | 0070 | 6164 | 5f64 | 6174 | 613a | 7428 | 302c | 3135 |
| 4337740 | 293d | 2a28 | 302c | 3134 | 293d | 7873 | 7061 | 645f | 6461 | 7461 | 5f73 | 7472 | 7563 | 743a | 0070 | 6164 | 5f64 | 6174 | 615f | 7374 | 7275 | 6374 | 3a54 | 2830 |
| 4340020 | 2c31 | 3429 | 3d73 | 3136 | 6265 | 6769 | 6e5f | 6d61 | 6769 | 633a | 2830 | 2c31 | 292c | 302c | 3332 | 3b70 | 6c61 | 7374 | 3a28 | 302c | 3136 | 293d | 2a28 | 302c |
| 4340100 | 3137 | 293d | 2a28 | 302c | 3134 | 292c | 3332 | 2c33 | 323b | 6e65 | 7874 | 3a28 | 302c | 3137 | 292c | 3634 | 2c33 | 323b | 656e | 645f | 6d61 | 6769 | 633a | 2830 |
| 4340160 | 2c31 | 292c | 3936 | 2c33 | 323b | 3b00 | 616c | 6c6f | 6361 | 7465 | 645f | 626c | 6f63 | 6b5f | 6461 | 7461 | 3a74 | 2830 | 2c31 | 3929 | 3d2a | 2830 | 2c31 | 3829 |
| 4340240 | 3d78 | 7361 | 6c6c | 6f63 | 6174 | 6564 | 5f62 | 6c6f | 636b | 5f64 | 6174 | 615f | 7374 | 7275 | 6374 | 3a00 | 616c | 6c6f | 6361 | 7465 | 645f | 626c | 6f63 | 6b5f |
| 4340320 | 6461 | 7461 | 5f73 | 7472 | 7563 | 743a | 5428 | 302c | 3139 | 293d | 7338 | 7369 | 7a65 | 3a28 | 302c | 3829 | 2c30 | 2c33 | 323b | 6d65 | 6d6f | 7279 | 3a28 | 302c |
| 4340400 | 3129 | 2c33 | 322c | 3332 | 3b3b | 006d | 615f | 696e | 6974 | 6961 | 6c69 | 7a65 | 5f67 | 726f | 7570 | 5f66 | 6f72 | 5f67 | 656e | 6572 | 616c | 5f66 | 7265 | 653a |
| 4340460 | 4628 | 302c | 3131 | 2900 | 6772 | 6f75 | 703a | 7028 | 342c | 3132 | 2900 | 732d | 3033 | 2f6d | 6167 | 662e | 6300 | 6d61 | 6b65 | 5f66 | 7265 | 655f | 6c69 | 7374 |
| 4340540 | 3a66 | 2830 | 2c31 | 2900 | 7066 | 7265 | 655f | 6c69 | 7374 | 3a70 | 2830 | 2c32 | 3029 | 3d2a | 2834 | 2c31 | 3429 | 0067 | 726f | 7570 | 3a70 | 2834 | 2c31 | 3229 |
| 4340620 | 006d | 615f | 6766 | 616c | 6c6f | 633a | 4628 | 332c | 3129 | 0073 | 697a | 653a | 7028 | 302c | 3829 | 0067 | 726f | 7570 | 3a70 | 2834 | 2c31 | 3229 | 006f | 6c64 |
| 4340700 | 5f73 | 697a | 653a | 2830 | 2c38 | 2900 | 7061 | 645f | 6f66 | 6673 | 6574 | 3a28 | 302c | 3829 | 0061 | 6c6c | 6f63 | 6174 | 6564 | 5f62 | 6c6f | 636b | 3a72 | 2830 |
| 4340760 | 2c32 | 3129 | 3d2a | 2830 | 2c31 | 3829 | 0072 | 6574 | 3a28 | 332c | 3129 | 0061 | 6c6c | 6f63 | 6174 | 655f | 626c | 6f63 | 6b3a | 6628 | 302c | 3231 | 2900 | 7369 |
| 4341040 | 7a65 | 3a70 | 2830 | 2c38 | 2900 | 6772 | 6f75 | 703a | 7028 | 342c | 3132 | 2900 | 616c | 6c6f | 6361 | 7465 | 645f | 626c | 6f63 | 6b3a | 2830 | 2c32 | 3129 | 0067 |
| 4341120 | 6574 | 5f6d | 656d | 6f72 | 795f | 6672 | 6f6d | 5f73 | 6461 | 6c6c | 5f62 | 6c6f | 636b | 733a | 6628 | 302c | 3231 | 2900 | 7369 | 7a65 | 3a70 | 2830 | 2c38 | 2900 |
| 4341200 | 6672 | 6565 | 5f6c | 6973 | 743a | 7028 | 342c | 3134 | 2900 | 7066 | 7265 | 655f | 626c | 6f63 | 6b3a | 7228 | 302c | 3232 | 293d | 2a28 | 342c | 3130 | 2900 | 6672 |
| 4341260 | 6565 | 5f62 | 6c6f | 636b | 3a72 | 2834 | 2c31 | 3029 | 0067 | 6574 | 5f6d | 6564 | 6f72 | 795f | 6672 | 6f6d | 5f62 | 6967 | 5f62 | 6c6f | 636b | 733a | 6628 | 302c |
| 4341340 | 3231 | 2900 | 7369 | 7a65 | 3a70 | 2830 | 2c38 | 2900 | 6672 | 6565 | 5f6c | 6973 | 743a | 7028 | 342c | 3134 | 2900 | 7369 | 7a65 | 3a72 | 2830 | 2c38 | 2900 | 6865 |
| 4341420 | 6164 | 6572 | 3a28 | 342c | 3629 | 006c | 6173 | 745f | 626c | 6f63 | 6b3a | 7228 | 342c | 3130 | 2900 | 7468 | 6973 | 5f62 | 6c6f | 636b | 3a72 | 2834 | 2c31 | 3029 |
| 4341500 | 0066 | 6f75 | 6e64 | 5f62 | 6c6f | 636b | 3a28 | 342c | 3130 | 2900 | 7072 | 655f | 666f | 756e | 645f | 626c | 6f63 | 6b3a | 2834 | 2c31 | 3029 | 0074 | 6869 | 735f |
| 4341560 | 7369 | 7a65 | 3a72 | 2830 | 2c31 | 2900 | 666f | 756e | 645f | 7369 | 7a65 | 3a72 | 2830 | 2c31 | 2900 | 6765 | 745f | 6e65 | 775f | 6d65 | 6d6f | 7279 | 3a66 | 2830 |

| | | | | | | | | | | | | | | | | | | | | | | | | |
|---|---|---|---|---|---|---|---|---|---|---|---|---|---|---|---|---|---|---|---|---|---|---|---|---|
| 4341640 | 2c31 | 2900 | 7061 | 6c6c | 6f63 | 6174 | 6564 | 5f62 | 6c6f | 636b | 3a70 | 2830 | 2c32 | 3329 | 3d2a | 2830 | 2c32 | 3129 | 0073 | 697a | 653a | 7028 | 302c | 3829 |
| 4341720 | 0067 | 726f | 7570 | 3a70 | 2834 | 2c31 | 3229 | C073 | 696d | 706c | 655f | 616c | 6c6f | 633a | 6628 | 302c | 3129 | 0070 | 6d65 | 633a | 7028 | 302c | 3234 | 293d |
| 4342000 | 2a28 | 332c | 3129 | 0073 | 697a | 653a | 7028 | 302c | 3829 | C067 | 726f | 7570 | 3a70 | 2834 | 2c31 | 3229 | 0067 | 6574 | 5f6d | 6f72 | 655f | 6d65 | 6d6f | 7279 |
| 4342060 | 3a66 | 2830 | 2c31 | 2900 | 7369 | 7a65 | 3a70 | 2830 | 2c38 | 2900 | 6772 | 6f75 | 703a | 7028 | 342c | 3132 | 2900 | 6672 | 6565 | 5f62 | 6c6f | 636b | 3a28 | 342c |
| 4342140 | 3130 | 2900 | 626c | 6f63 | 6b3a | 2834 | 2c31 | 3829 | 0073 | 697a | 655f | 746f | 5f67 | 6574 | 3a28 | 302c | 3829 | 0073 | 697a | 655f | 746f | 5f61 | 6c6c | 6f63 |
| 4342220 | 3a28 | 302c | 3829 | 006d | 615f | 6766 | 6672 | 6565 | 3a46 | 2833 | 2c31 | 2900 | 703a | 7028 | 332c | 3129 | 0067 | 726f | 7570 | 3a70 | 2834 | 2c31 | 3229 | 0067 |
| 4342300 | 726f | 7570 | 3a72 | 2834 | 2c31 | 3229 | 0061 | 6c6c | 6f63 | 6174 | 6564 | 5f62 | 6c6f | 636b | 3a72 | 2830 | 2c32 | 3129 | 0069 | 6e73 | 6572 | 745f | 6672 | 6565 |
| 4342360 | 5f62 | 6c6f | 636b | 5f69 | 6e74 | 6f5f | 6672 | 6565 | 5f6c | 6973 | 743a | 6628 | 302c | 3129 | 0066 | 7265 | 655f | 6c69 | 7374 | 3a70 | 2834 | 2c31 | 3429 | 0066 |
| 4342440 | 7265 | 655f | 626c | 6f63 | 6b3a | 7028 | 342c | 3130 | 2900 | 7369 | 7a65 | 3a28 | 302c | 3129 | 0069 | 6e73 | 6572 | 745f | 696e | 746f | 5f62 | 6c6f | 636b | 5f6c |
| 4342520 | 6973 | 743a | 6628 | 302c | 3129 | 0070 | 626c | 6f63 | 6b5f | 6c69 | 7374 | 3a70 | 2830 | 2c32 | 3229 | 0066 | 7265 | 655f | 626c | 6f63 | 6b3a | 7028 | 342c | 3130 |
| 4342600 | 2900 | 6d61 | 6b65 | 5f70 | 6164 | 3a66 | 2830 | 2c31 | 2900 | 7061 | 643a | 7028 | 302c | 3137 | 2900 | 6772 | 6f75 | 703a | 7028 | 342c | 3132 | 2900 | 6e65 | 7874 |
| 4342660 | 3a28 | 302c | 3137 | 2900 | 6465 | 6c65 | 7465 | 5f70 | 6164 | 3a66 | 2830 | 2c31 | 2900 | 7061 | 643a | 7028 | 302c | 3137 | 2900 | 6e65 | 7874 | 3a28 | 302c | 3137 |
| 4342740 | 2900 | 6d61 | 5f67 | 6676 | 6572 | 6966 | 795f | 6772 | 6f75 | 703a | 4628 | 332c | 3129 | 0067 | 726f | 7570 | 3a70 | 2834 | 2c31 | 3229 | 0070 | 6164 | 3a28 | 302c |
| 4343020 | 3137 | 2900 | 7665 | 7269 | 6679 | 5f66 | 7265 | 655f | 6c69 | 7374 | 3a66 | 2830 | 2c31 | 2900 | 6772 | 6f75 | 703a | 7028 | 342c | 3132 | 2900 | 6672 | 6565 | 5f6c |
| 4343100 | 6973 | 743a | 2834 | 2c31 | 3429 | 0073 | 697a | 653a | 2830 | 2c31 | 2900 | 7665 | 7269 | 6679 | 5f73 | 6d61 | 6c6c | 5f66 | 7265 | 655f | 626c | 6f63 | 6b5f | 6c69 |
| 4343160 | 7374 | 3a66 | 2830 | 2c31 | 2900 | 6672 | 6565 | 5f62 | 6c6f | 636b | 5f6c | 6973 | 743a | 7028 | 342c | 3130 | 2900 | 7369 | 7a65 | 3a70 | 2830 | 2c31 | 2900 | 6772 |
| 4343240 | 6f75 | 703a | 7028 | 342c | 3132 | 2900 | 6672 | 6565 | 5f62 | 6c6f | 636b | 3a28 | 342c | 3130 | 2900 | 7665 | 7269 | 6679 | 5f73 | 6d61 | 6c6c | 5f66 | 7265 | 655f |
| 4343320 | 626c | 6f63 | 6b3a | 6628 | 302c | 3129 | 0066 | 7265 | 655f | 626c | 6f63 | 6b3a | 7028 | 342c | 3130 | 2900 | 7369 | 7a65 | 3a70 | 2830 | 2c31 | 2900 | 6772 | 6f75 |
| 4343400 | 703a | 7028 | 342c | 3132 | 2900 | 7665 | 7269 | 6679 | 5f62 | 6967 | 5f66 | 7265 | 655f | 626c | 6f63 | 6b5f | 6c69 | 7374 | 3a66 | 2830 | 2c31 | 2900 | 6672 | 6565 |
| 4343460 | 5f62 | 6c6f | 636b | 5f6c | 6973 | 743a | 7028 | 342c | 3130 | 2900 | 6772 | 6f75 | 703a | 7028 | 342c | 3132 | 2900 | 6672 | 6565 | 5f62 | 6c6f | 636b | 3a28 | 342c |
| 4343540 | 3130 | 2900 | 7665 | 7269 | 6679 | 5f62 | 6967 | 5f66 | 7265 | 655f | 626c | 6f63 | 6b3a | 6628 | 302c | 3129 | 0066 | 7265 | 655f | 626c | 6f63 | 6b3a | 7028 | 342c |
| 4343620 | 3130 | 2900 | 6772 | 6f75 | 703a | 7028 | 342c | 3132 | 2900 | 6874 | 2e6f | 005f | 7374 | 5f68 | 5f69 | 6400 | 5f64 | 656c | 6574 | 655f | 6269 | 6e61 | 7279 | 5f74 |
| 4343700 | 7265 | 655f | 6e6f | 6465 | 005f | 6568 | 5f69 | 6400 | 5f68 | 745f | 6964 | 005f | 6d61 | 5f69 | 6400 | 5f69 | 6e73 | 6572 | 745f | 6861 | 7368 | 5f74 | 6162 | 6c65 |
| 4343760 | 002f | 686f | 6d65 | 2f66 | 7331 | 302f | 622f | 746f | 6f6c | 6c69 | 622f | 7265 | 6c31 | 3030 | 2f00 | 732d | 3039 | 2f68 | 742e | 6300 | 696e | 743a | 7428 | 302c |
| 4344040 | 3129 | 3d72 | 2830 | 2c31 | 293b | 2d32 | 3134 | 3734 | 3833 | 3634 | 383b | 3231 | 3437 | 3438 | 3336 | 3437 | 3b00 | 6368 | 6172 | 3a74 | 2830 | 2c32 | 293d | 7228 |
| 4344120 | 302c | 3229 | 3b30 | 3b31 | 3237 | 3b00 | 6c6f | 6e67 | 3a74 | 2830 | 2c33 | 293d | 7228 | 302c | 3129 | 3b2d | 3231 | 3437 | 3438 | 3336 | 3438 | 3b32 | 3134 | 3734 |
| 4344200 | 3833 | 3634 | 373b | 0073 | 686f | 7274 | 3a74 | 2830 | 2c34 | 293d | 7228 | 302c | 3129 | 3b2d | 3332 | 3736 | 383b | 3332 | 3736 | 373b | 0075 | 6e73 | 6967 | 6e65 |
| 4344260 | 6420 | 6368 | 6172 | 3a74 | 2830 | 2c35 | 293d | 7228 | 302c | 3129 | 3b30 | 3b32 | 3535 | 3b00 | 756e | 7369 | 676e | 6564 | 2073 | 686f | 7274 | 3a74 | 2830 | 2c36 |
| 4344340 | 293d | 7228 | 302c | 3129 | 3b30 | 3b36 | 3535 | 3335 | 3b00 | 756e | 7369 | 676e | 6564 | 206c | 6f6e | 673a | 7428 | 302c | 3729 | 3d72 | 2830 | 2c31 | 293b | 303b |
| 4344420 | 2d31 | 3b00 | 756e | 7369 | 676e | 6564 | 2069 | 6e74 | 3a74 | 2830 | 2c38 | 293d | 7228 | 302c | 3129 | 3b30 | 3b2d | 313b | 0066 | 6c6f | 6174 | 3a74 | 2830 | 2c39 |
| 4344500 | 293d | 7228 | 302c | 3129 | 3b34 | 3b30 | 3b00 | 646f | 7562 | 6c65 | 3a74 | 2830 | 2c31 | 3029 | 3d72 | 2830 | 2c31 | 293b | 383b | 303b | 0076 | 6f69 | 643a | 7428 |
| 4344560 | 302c | 3131 | 293d | 2830 | 2c31 | 3129 | 003f | 3f3f | 3a74 | 2830 | 2c31 | 3229 | 3d28 | 302c | 3129 | 0069 | 6e63 | 6c75 | 6465 | 2f65 | 682e | 6800 | 696e | 636c |
| 4344640 | 7564 | 652f | 6568 | 2e68 | 0065 | 685f | 6964 | 3a53 | 2831 | 2c31 | 293d | 6172 | 2830 | 2c31 | 293b | 303b | 3636 | 3b28 | 302c | 3229 | 0065 | 685f | 6578 | 6365 |
| 4344720 | 7074 | 696f | 6e3a | 7428 | 302c | 3129 | 0062 | 6f6f | 6c65 | 616e | 3a74 | 2830 | 2c31 | 2900 | 696e | 636c | 7564 | 652f | 6d61 | 2e68 | 0069 | 6e63 | 6c75 | 6465 |
| 4345000 | 2f6d | 612e | 6800 | 6d61 | 5f69 | 643a | 5328 | 312c | 3129 | 0070 | 6f69 | 6e74 | 6572 | 3a74 | 2832 | 2c31 | 293d | 2a28 | 322c | 3229 | 3d61 | 7228 | 302c | 3129 |
| 4345060 | 3b30 | 3b30 | 3b28 | 322c | 3329 | 3d61 | 7228 | 302c | 3129 | 3b30 | 3b30 | 3b28 | 322c | 3429 | 3d61 | 7228 | 302c | 3129 | 3b30 | 3b30 | 3b28 | 322c | 3529 | 3d61 |
| 4345140 | 7228 | 302c | 3129 | 3b30 | 3b30 | 3b28 | 322c | 3629 | 3d61 | 7228 | 302c | 3129 | 3b30 | 3b30 | 3b28 | 322c | 3729 | 3d61 | 7228 | 302c | 3129 | 3b30 | 3b30 | 3b28 |
| 4345220 | 302c | 3229 | 006d | 615f | 6772 | 6f75 | 703a | 7428 | 322c | 3829 | 3d2a | 2832 | 2c39 | 293d | 7334 | 6d61 | 5f67 | 726f | 7570 | 3a28 | 302c | 3129 | 2c30 | 2c33 |
| 4345300 | 323b | 3b00 | 6675 | 6e63 | 7469 | 6f6e | 3a74 | 2832 | 2c31 | 3029 | 3d2a | 2832 | 2c31 | 3129 | 3d66 | 2830 | 2c31 | 2900 | 732d | 3039 | 2f68 | 742e | 6800 | 6874 |
| 4345360 | 5f74 | 6162 | 6c65 | 3a74 | 2833 | 2c31 | 293d | 2a28 | 332c | 3229 | 3d73 | 3468 | 745f | 7461 | 626c | 653a | 2830 | 2c31 | 292c | 302c | 3332 | 3b3b | 0069 | 6e63 |
| 4345440 | 6c75 | 6465 | 2f73 | 742e | 6800 | 2f75 | 7372 | 2f69 | 6e63 | 6c75 | 6465 | 2f73 | 7472 | 696e | 672e | 6800 | 696e | 636c | 7564 | 652f | 7374 | 2e68 | 0073 | 745f |
| 4345520 | 685f | 6964 | 3a53 | 2831 | 2c31 | 2900 | 732d | 3039 | 2f68 | 742e | 6300 | 6874 | 5f69 | 643a | 5328 | 312c | 3129 | 0054 | 5245 | 455f | 544f | 503a | 7428 | 302c |
| 4345600 | 3133 | 293d | 7873 | 7472 | 6565 | 5f74 | 6f70 | 5f73 | 7472 | 7563 | 743a | 0074 | 7265 | 655f | 746f | 703a | 7428 | 302c | 3134 | 293d | 2a28 | 302c | 3133 | 2900 |
| 4345660 | 4249 | 4e41 | 5259 | 5f54 | 5245 | 453a | 7428 | 302c | 3135 | 293d | 7873 | 6269 | 6e61 | 7279 | 5f74 | 7265 | 655f | 7374 | 7275 | 6374 | 3a00 | 6269 | 6e61 | 7279 |
| 4345740 | 5f74 | 7265 | 653a | 7428 | 302c | 3136 | 293d | 2a28 | 302c | 3135 | 2900 | 7472 | 6565 | 5f74 | 6f70 | 5f73 | 7472 | 7563 | 743a | 5428 | 302c | 3133 | 293d | 7333 |
| 4346020 | 366d | 6167 | 6963 | 3a28 | 302c | 3137 | 293d | 2a28 | 302c | 3229 | 2c30 | 2c33 | 323b | 6861 | 7368 | 5f66 | 756e | 6374 | 696f | 6e3a | 2832 | 2c31 | 3029 | 2c33 |
| 4346100 | 322c | 3332 | 3b6b | 6579 | 735f | 6571 | 7561 | 6c5f | 6675 | 6e63 | 7469 | 6f6e | 3a28 | 322c | 3130 | 292c | 3634 | 2c33 | 323b | 636f | 7079 | 5f66 | 756e | 6374 |
| 4346160 | 696f | 6e3a | 2830 | 2c31 | 3829 | 3d2a | 2830 | 2c31 | 3929 | 3166 | 2832 | 2c31 | 292c | 3936 | 2c33 | 323b | 6672 | 6565 | 5f66 | 756e | 6374 | 696f | 6e3a | 2830 |
| 4346240 | 2c32 | 3029 | 3d2a | 2830 | 2c32 | 3129 | 3d66 | 2830 | 2c31 | 3129 | 2c31 | 3238 | 2c33 | 323b | 746f | 703a | 2830 | 2c31 | 3629 | 2c31 | 3630 | 2c33 | 323b | 6772 |
| 4346320 | 6f75 | 703a | 2832 | 2c38 | 292c | 3139 | 322c | 3332 | 3b6c | 6973 | 745f | 6669 | 7273 | 743a | 2830 | 2c31 | 3629 | 2c32 | 3234 | 2c33 | 323b | 7369 | 7a65 | 3a28 |
| 4346400 | 302c | 3129 | 2c32 | 3536 | 2c33 | 323b | 3b00 | 6269 | 6e61 | 7279 | 5f74 | 7265 | 655f | 7374 | 7275 | 6374 | 3a54 | 2830 | 2c31 | 3529 | 3d73 | 3238 | 6b65 | 793a |
| 4346460 | 2832 | 2c31 | 292c | 302c | 3332 | 3b68 | 6173 | 6865 | 645f | 6b65 | 793a | 2830 | 2c31 | 292c | 3332 | 2c33 | 323b | 6461 | 7461 | 3a28 | 322c | 3129 | 2c36 | 342c |
| 4346540 | 3332 | 3b6c | 6566 | 743a | 2830 | 2c32 | 3229 | 3d2a | 2830 | 2c31 | 3529 | 2c39 | 362c | 3332 | 3b72 | 6967 | 6874 | 3a28 | 302c | 3232 | 292c | 3132 | 382c | 3332 |
| 4346620 | 3b6e | 6578 | 743a | 2830 | 2c32 | 3229 | 2c31 | 3630 | 2c33 | 323b | 6c61 | 7374 | 3a28 | 302c | 3232 | 292c | 3139 | 322c | 3332 | 3b3b | 0068 | 745f | 6d61 | 6b65 |
| 4346700 | 5f74 | 6162 | 6c65 | 3a46 | 2833 | 2c31 | 2900 | 6861 | 7368 | 5f66 | 756e | 6374 | 696f | 6e3a | 7028 | 322c | 3130 | 2900 | 6b65 | 7973 | 5f65 | 7175 | 616c | 5f66 |

```
4346760 756e 6374 696f 6e3a 7028 322c 3130 2900 636f 7079 5f66 756e 6374 696f 6e3a 7028 302c 3138 2900 6672 6565 5f66 756e 6374
4347040 696f 6e3a 7028 302c 3230 2900 7461 626c 655f 7369 7a65 3a70 2830 2c31 2900 7461 626c 653a 2830 2c32 3329 3d2a 2830 2c31
4347120 3329 0068 745f 6461 6b65 5f70 6f69 6e74 6572 5f74 6162 6c65 3a46 2833 2c31 2900 7369 7a65 3a70 2830 2c31 2900 6874 5f6d
4347200 616b 655f 7374 7269 6e67 5f74 6162 6c65 3a46 2833 2c31 2900 7369 7a65 3a70 2830 2c31 2900 6874 5f66 7265 655f 7461 626c
4347260 653a 4628 302c 3131 2900 7768 6963 685f 7461 626c 653a 7028 332c 3129 0074 6162 6c65 3a28 302c 3233 2900 6c61 7374 3a28
4347340 302c 3232 2900 6874 5f69 735f 656c 656d 656e 743a 4628 302c 3129 0070 6173 7365 645f 7461 626c 653a 7028 332c 3129 006b
4347420 6579 3a70 2832 2c31 2900 7461 626c 653a 2830 2c32 3329 0068 6173 685f 7661 6c75 653a 7228 302c 3129 0074 7265 653a 7228
4347500 302c 3232 2900 6874 5f67 6574 5f65 6c65 6d65 6e74 3a46 2832 2c31 2900 7061 7373 6564 5f74 6162 6c65 3a70 2833 2c31 2900
4347560 6b65 793a 7028 322c 3129 0074 6162 6c65 3a28 332c 3233 2900 6861 7368 5f76 616c 7565 3a72 2830 2c31 2900 7472 6565 3a72
4347640 2830 2c32 3229 0068 745f 696e 7365 7274 5f65 6c65 6d65 6e74 3a46 2830 2c31 2900 7061 7373 6564 5f74 6162 6c65 3a70 2833
4347720 2c31 2900 6b65 793a 7028 322c 3129 0064 6174 613a 7028 322c 3129 0068 745f 7265 706c 6163 655f 656c 656d 656e 743a 4628
4350000 302c 3129 0070 6173 7365 645f 7461 626c 653a 7028 332c 3129 006b 6579 3a70 2832 2c31 2900 6461 7461 3a70 2832 2c31 2900
4350060 696e 7365 7274 5f68 6173 685f 7461 626c 653a 6628 302c 3129 0074 6162 6c65 3a70 2830 2c32 3329 006b 6579 3a70 2832 2c31
4350140 2900 6461 7461 3a70 2832 2c31 2900 666f 7263 653a 7028 302c 3129 0068 6173 685f 7561 6c75 653a 7228 302c 3129 0070 7472
4350220 6565 3a72 2830 2c32 3429 3d2a 2830 2c32 3229 0074 7265 653a 7228 302c 3232 2900 6874 5f64 656c 6574 655f 656c 656d 656e
4350300 743a 4628 322c 3129 0070 6173 7365 645f 7461 626c 653a 7028 332c 3129 006b 6579 3a70 2832 2c31 2900 7461 626c 653a 2830
4350360 2c32 3329 006d 6173 685f 7661 6c75 653a 7228 302c 3129 0070 7472 6565 3a72 2830 2c32 3429 0072 6574 3a28 322c 3129 0064
4350440 656c 6574 655f 6269 6e61 7279 5f74 7265 655f 6e6f 6465 3a66 2830 2c31 3129 0066 7265 655f 6675 6e63 7469 6f6e 3a70 2830
4350520 2c32 3029 0070 7472 6565 3a70 2830 2c32 3429 0070 7472 6565 3a72 2830 2c32 3429 0074 656d 703a 2830 2c32 3229 0070 6c65
4350600 6674 3a28 302c 3234 2900 7265 706c 6163 653a 2830 2c32 3229 0068 745f 6765 745f 6e65 7874 5f65 6c65 6d65 6e74 3a46 2832
4350660 2c31 2900 7461 626c 653a 7028 332c 3129 006c 6973 745f 706f 696e 7465 723a 7028 322c 3129 0070 6b65 793a 7028 302c 3235
4350740 293d 2a28 322c 3129 0070 6461 7461 3a70 2830 2c32 3529 006e 6578 745f 6c69 7374 5f70 6f69 6e74 6572 3a28 322c 3129 0068
4351020 745f 6765 745f 636f 756e 743a 4628 302c 3129 0074 6162 6c65 3a70 2833 2c31 2900 6874 5f76 6572 6966 795f 7461 626c 653a
4351100 4628 302c 3129 0077 6869 6368 5f74 6162 6c65 3a70 2833 2c31 2900 7461 626c 653a 2830 2c32 3329 0072 6574 3a28 302c 3129
4351160 0068 745f 6973 5f74 6162 6c65 3a46 2830 2c31 2900 7768 6963 685f 7461 626c 653a 7028 332c 3129 0074 6162 6c65 3a28 302c
4351240 3233 2900 6d6c 2e6f 005f 6d6c 5f69 6400 5f72 6373 5f69 6400 2f68 6f6d 652f 6673 3130 2f62 2f74 6f6f 6c6c 6962 2f72 656c
4351320 3130 302f 0073 2d30 312f 6d6c 2e63 0069 6e74 3a74 2830 2c31 293d 7228 302c 3129 3b2d 3231 3437 3438 3336 3438 3b32 3134
4351400 3734 3833 3634 373b 0063 6861 723a 7428 302c 3229 3d72 2830 2c32 293b 303b 3132 373b 006c 6f6e 673a 7428 302c 3329 3d72
4351460 2830 2c31 293b 2d32 3134 3734 3833 3634 383b 3231 3437 3438 3336 3437 3b00 7368 6f72 743a 7428 302c 3429 3d72 2830 2c31
4351540 293b 2d33 3237 3638 3b33 3237 3637 3b00 756e 7369 676e 6564 2063 6861 723a 7428 302c 3529 3d72 2830 2c31 293b 303b 3235
4351620 353b 0075 6e73 6967 6e65 6420 7368 6f72 743a 7428 302c 3629 3d72 2830 2c31 293b 303b 3635 3533 353b 0075 6e73 6967 6e65
4351700 6420 6c6f 6e67 3a74 2830 2c37 293d 7228 302c 3129 3b30 3b2d 313b 0075 6e73 6967 6e65 6420 696e 743a 7428 302c 3829 3d72
4351760 2830 2c31 293b 303b 2d31 3b00 666c 6f61 743a 7428 302c 3929 3d72 2830 2c31 293b 343b 303b 0064 6f75 626c 653a 7428 302c
4352040 3130 293d 7228 302c 3129 3b38 3b30 3b00 766f 6964 3a74 2830 2c31 3129 3d28 302c 3131 2900 3f3f 3f3a 7428 302c 3132 293d
4352120 2830 2c31 2900 7263 735f 6964 3a53 2830 2c31 3329 3d61 7228 302c 3129 3b30 3b36 363b 2830 2c32 2900 2f75 7372 2f69 6e63
4352200 6c75 6465 2f73 7464 696f 2e68 0073 2d30 312f 6d6c 2e68 0073 2d30 312f 6d6c 2e68 006d 6c5f 6964 3a53 2830 2c31 3329 0070
4352260 6f69 6e74 6572 3a74 2830 2c31 3429 3d2a 2830 2c31 3529 3d61 7228 302c 3129 3b30 3b30 3b28 302c 3136 293d 6172 2830 2c31
4352340 293b 303b 303b 2830 2c31 3729 3d61 7228 302c 3129 3b30 3b30 3b28 302c 3138 293d 6172 2830 2c31 293b 303b 303b 2830 2c32
4352420 2900 6d6c 5f61 6c6c 6f63 3a46 2830 2c31 3929 3d2a 2830 2c31 2900 7369 7a65 3a70 2830 2c38 2900 732d 3031 2f6d 6c2e 6300
4352500 6d6c 5f66 7265 653a 4628 302c 3131 2900 6d65 636f 7279 3a70 2830 2c31 3929 0073 742e 6f00 5f6c 6574 7465 7273 005f 6e75
4352560 6d62 6572 7300 5f73 745f 636f 7079 5f69 6e73 6572 7400 5f69 6e69 7469 616c 697a 655f 6361 7365 005f 7374 5f68 5f69 6400
4352640 5f65 685f 6964 005f 6361 7365 5f69 6e69 7469 616c 697a 6564 005f 6d61 5f69 6400 5f64 6967 6974 7300 5f6c 6f77 6572 6361
4352720 7365 005f 746f 5f75 7070 6572 6361 7365 005f 746f 5f6c 6f77 6572 6361 7365 005f 636f 6e76 6572 7369 6f6e 005f 7370 6163
4353000 6500 5f73 7472 696e 675f 6964 005f 7570 7065 7263 6173 6500 5f73 7061 6365 7300 5f64 6967 6974 5f76 616c 7565 005f 7374
4353060 5f67 6574 5f6e 6578 745f 6669 656c 6400 2f68 6f6d 652f 6673 3130 2f62 2f74 6f6f 6c6c 6962 2f72 656c 3130 302f 0073 2d30
4353140 342f 7374 2e63 0069 6e74 3a74 2830 2c31 2934 7228 302c 3129 3b2d 3231 3437 3438 3336 3438 3b32 3134 3734 3833 3634 373b
4353220 0063 6861 723a 7428 302c 3229 3d72 2830 2c32 293b 303b 3132 373b 006c 6f6e 673a 7428 302c 3329 3d72 2830 2c31 293b 2d32
4353300 3134 3734 3833 3634 383b 3231 3437 3438 3336 3437 3b00 7368 6f72 743a 7428 302c 3429 3d72 2830 2c31 293b 2d33 3237 3638
4353360 3b33 3237 3637 3b00 756e 7369 676e 6564 2063 6861 723a 7428 302c 3529 3d72 2830 2c31 293b 303b 3235 353b 0075 6e73 6967
4353440 6e65 6420 7368 6f72 743a 7428 302c 3629 3d72 2830 2c31 293b 303b 3635 3533 353b 0075 6e73 6967 6e65 6420 6c6f 6e67 3a74
4353520 2830 2c37 293d 7228 302c 3129 3b30 3b2d 313b 0075 6e73 6967 6e65 6420 696e 743a 7428 302c 3829 3d72 2830 2c31 293b 303b
4353600 2d31 3b00 666c 6f61 743a 7428 302c 3929 3d72 2830 2c31 293b 343b 303b 0064 6f75 626c 653a 7428 302c 3130 293d 7228 302c
4353660 3129 3b38 3b30 3b00 766f 6964 3a74 2830 2c31 3129 3d28 302c 3131 2900 3f3f 3f3a 7428 302c 3132 293d 2830 2c31 2900 696e
4353740 636c 7564 652f 6568 2e68 0069 6e63 6c75 6465 2f65 682e 6800 6568 5f69 643a 5328 312c 3129 3d61 7228 302c 3129 3b30 3b36
4354020 363b 2830 2c32 2900 6568 5f65 7063 6570 7469 6f6e 3a74 2830 2c31 2900 626f 6f6c 6561 6e3a 7428 302c 3129 0069 6e63 6c75
```

| | | | | | | | | | | | | | | | | | | | | | | | | |
|---|---|---|---|---|---|---|---|---|---|---|---|---|---|---|---|---|---|---|---|---|---|---|---|---|
| 4354100 | 6465 | 2f6d | 612e | 6800 | 696e | 636c | 7564 | 652f | 6d61 | 2e68 | 006d | 615f | 6964 | 3a53 | 2831 | 2c31 | 2900 | 706f | 696e | 7465 | 723a | 7428 | 322c | 3129 |
| 4354160 | 3d2a | 2832 | 2c32 | 293d | 6172 | 2830 | 2c31 | 293b | 303b | 303b | 2832 | 2c33 | 293d | 6172 | 2830 | 2c31 | 293b | 303b | 303b | 2832 | 2c34 | 293d | 6172 | 2830 |
| 4354240 | 2c31 | 293b | 303b | 303b | 2832 | 2c35 | 293d | 6172 | 2830 | 2c31 | 293b | 303b | 303b | 2832 | 2c36 | 293d | 6172 | 2830 | 2c31 | 293b | 303b | 303b | 2832 | 2c37 |
| 4354320 | 293d | 6172 | 2830 | 2c31 | 293b | 303b | 303b | 2830 | 2c32 | 2900 | 6d61 | 5f67 | 726f | 7570 | 3a74 | 2832 | 2c38 | 293d | 2a28 | 322c | 3929 | 3d73 | 346d | 615f |
| 4354400 | 6772 | 6f75 | 703a | 2830 | 2c31 | 292c | 302c | 3332 | 3b3b | 0066 | 756e | 6374 | 696f | 6e3a | 7428 | 322c | 3130 | 293d | 2a28 | 322c | 3131 | 293d | 6628 | 302c |
| 4354460 | 3129 | 0073 | 2d30 | 342f | 7374 | 2e68 | 002f | 7573 | 722f | 696e | 636c | 7564 | 652f | 7374 | 7269 | 6e67 | 2e68 | 0073 | 2d30 | 342f | 7374 | 2e68 | 0073 | 745f |
| 4354540 | 685f | 6964 | 3a53 | 2831 | 2c31 | 2900 | 732d | 3034 | 2f73 | 742e | 6300 | 7374 | 7269 | 6e67 | 5f69 | 643a | 5328 | 312c | 3129 | 0053 | 5452 | 494e | 475f | 5441 |
| 4354620 | 424c | 455f | 4e4f | 4445 | 3a74 | 2830 | 2c31 | 3329 | 3d78 | 7373 | 7472 | 696e | 675f | 7461 | 626c | 655f | 6e6f | 6465 | 5f73 | 7472 | 7563 | 743a | 0073 | 7472 |
| 4354700 | 696e | 675f | 7461 | 626c | 655f | 6e6f | 6465 | 3a74 | 2830 | 2c31 | 3429 | 3d2a | 2830 | 2c31 | 3329 | 0073 | 7472 | 696e | 675f | 7461 | 626c | 655f | 6e6f | 6465 |
| 4354760 | 5f73 | 7472 | 7563 | 743a | 5428 | 302c | 3133 | 293d | 7331 | 3673 | 7472 | 696e | 673a | 2830 | 2c31 | 3529 | 3d2a | 2830 | 2c32 | 292c | 302c | 3332 | 3b68 | 6173 |
| 4355040 | 685f | 7661 | 6c75 | 653a | 2830 | 2c31 | 292c | 3332 | 2c33 | 323b | 6c65 | 6674 | 3a28 | 302c | 3136 | 293d | 2a28 | 302c | 3133 | 292c | 3634 | 2c33 | 323b | 7269 |
| 4355120 | 6768 | 743a | 2830 | 2c31 | 3629 | 2c39 | 362c | 3332 | 3b3b | 0063 | 6f6e | 7665 | 7273 | 696f | 6e3a | 5328 | 302c | 3137 | 293d | 6172 | 2830 | 2c31 | 293b | 303b |
| 4355200 | 3532 | 3b28 | 302c | 3229 | 0073 | 7061 | 6365 | 733a | 5328 | 302c | 3138 | 293d | 6172 | 2830 | 2c31 | 293b | 303b | 363b | 2830 | 2c32 | 2900 | 6469 | 6769 | 7473 |
| 4355260 | 3a53 | 2830 | 2c31 | 3929 | 3d61 | 7228 | 302c | 3129 | 3b30 | 3b31 | 303b | 2830 | 2c32 | 2900 | 6361 | 7365 | 5f69 | 6e69 | 7469 | 616c | 697a | 6564 | 3a53 | 2830 |
| 4355340 | 2c31 | 2900 | 6c6f | 7765 | 7263 | 6173 | 653a | 5328 | 302c | 3230 | 293d | 6172 | 2830 | 2c31 | 293b | 303b | 3235 | 353b | 2830 | 2c32 | 2900 | 7570 | 7065 | 7263 |
| 4355420 | 6173 | 653a | 5328 | 302c | 3230 | 2900 | 746f | 5f6c | 6f77 | 6572 | 6361 | 7365 | 3a53 | 2830 | 2c32 | 3029 | 0074 | 6f5f | 7570 | 7065 | 7263 | 6173 | 653a | 5328 |
| 4355500 | 302c | 3230 | 2900 | 6c65 | 7474 | 6572 | 733a | 5328 | 302c | 3230 | 2900 | 6e75 | 6d62 | 6572 | 733a | 5328 | 302c | 3230 | 2900 | 6469 | 6769 | 745f | 7661 | 6c75 |
| 4355560 | 653a | 5328 | 302c | 3230 | 2900 | 7370 | 6163 | 653a | 5328 | 302c | 3230 | 2900 | 696e | 6974 | 6961 | 6c69 | 7a65 | 5f63 | 6173 | 653a | 6628 | 302c | 3131 | 2900 |
| 4355640 | 7074 | 723a | 2830 | 2c31 | 3529 | 0069 | 3a28 | 302c | 3129 | 0073 | 745f | 636f | 6e76 | 6572 | 745f | 6368 | 6172 | 5f74 | 6f5f | 6e75 | 6d62 | 6572 | 3a46 | 2830 |
| 4355720 | 2c31 | 2900 | 633a | 7028 | 302c | 3229 | 0073 | 745f | 6c6f | 7765 | 7263 | 6173 | 655f | 6368 | 6172 | 3a46 | 2830 | 2c32 | 2900 | 633a | 7028 | 302c | 3229 | 0073 |
| 4356000 | 745f | 6c6f | 7765 | 7263 | 6173 | 655f | 7374 | 7269 | 6e67 | 3a46 | 2830 | 2c31 | 3129 | 0073 | 3a70 | 2830 | 2c31 | 3529 | 0070 | 3a28 | 302c | 3135 | 2900 | 7374 |
| 4356060 | 5f75 | 7070 | 6572 | 6361 | 7365 | 5f63 | 6861 | 723a | 4628 | 302c | 3229 | 0063 | 3a70 | 2830 | 2c32 | 2900 | 7374 | 5f75 | 7070 | 6572 | 6361 | 7365 | 5f73 | 7472 |
| 4356140 | 696e | 673a | 4628 | 302c | 3131 | 2900 | 733a | 7028 | 302c | 3135 | 2900 | 703a | 2830 | 2c31 | 3529 | 0073 | 745f | 636f | 6e63 | 6174 | 5f73 | 7472 | 696e | 673a |
| 4356220 | 4628 | 302c | 3135 | 2900 | 7331 | 3a70 | 2830 | 2c31 | 3529 | 0073 | 323a | 7028 | 302c | 3135 | 2900 | 636f | 7079 | 3a28 | 302c | 3135 | 2900 | 7074 | 723a | 2830 |
| 4356300 | 2c31 | 3529 | 0073 | 745f | 6861 | 7368 | 5f73 | 7472 | 696e | 673a | 4628 | 302c | 3129 | 0074 | 6578 | 743a | 7028 | 302c | 3135 | 2900 | 7465 | 7874 | 3a72 | 2830 |
| 4356360 | 2c31 | 3529 | 0072 | 6574 | 3a72 | 2830 | 2c31 | 2900 | 7374 | 5f69 | 735f | 6c6f | 7765 | 723a | 4628 | 302c | 3129 | 0063 | 3a70 | 2830 | 2c32 | 2900 | 7374 | 5f69 |
| 4356440 | 735f | 7570 | 7065 | 723a | 4628 | 302c | 3129 | 0063 | 3a70 | 2830 | 2c32 | 2900 | 7374 | 5f69 | 735f | 7370 | 6163 | 653a | 4628 | 302c | 3129 | 0063 | 3a70 | 2830 |
| 4356520 | 2c32 | 2900 | 7374 | 5f69 | 735f | 6469 | 6769 | 743a | 4628 | 302c | 3129 | 0063 | 3a70 | 2830 | 2c32 | 2900 | 7374 | 5f69 | 735f | 616c | 7068 | 613a | 4628 | 302c |
| 4356600 | 3129 | 0063 | 3a70 | 2830 | 2c32 | 2900 | 7374 | 5f69 | 735f | 616c | 7068 | 616e | 756d | 6572 | 6963 | 3a46 | 2830 | 2c31 | 2900 | 633a | 7028 | 302c | 3229 | 0073 |
| 4356660 | 745f | 636f | 7079 | 5f69 | 6e73 | 6572 | 743a | 6628 | 302c | 3135 | 2900 | 7465 | 7874 | 3a70 | 2830 | 2c31 | 3529 | 0074 | 6578 | 745f | 6275 | 6666 | 6572 | 3a56 |
| 4356740 | 2830 | 2c31 | 3529 | 0074 | 6578 | 745f | 6c65 | 6e67 | 7468 | 3a56 | 2830 | 2c31 | 2900 | 7265 | 743a | 2830 | 2c31 | 3529 | 006c | 656e | 6774 | 683a | 2830 | 2c31 |
| 4357020 | 2900 | 7374 | 5f69 | 6e73 | 6572 | 745f | 7374 | 7269 | 6e67 | 5f74 | 6162 | 6c65 | 3a46 | 2830 | 2c31 | 3529 | 0073 | 7472 | 696e | 673a | 7028 | 302c | 3135 | 2900 |
| 4357100 | 6e6f | 6465 | 3a56 | 2830 | 2c31 | 3629 | 0073 | 7472 | 696e | 675f | 6772 | 6f75 | 703a | 5628 | 322c | 3829 | 0070 | 6e6f | 6465 | 3a72 | 2830 | 2c32 | 3129 | 3d2a |
| 4357160 | 2830 | 2c31 | 3629 | 0068 | 6173 | 685f | 7661 | 6c75 | 653a | 7228 | 302c | 3129 | 0063 | 6d70 | 3a72 | 2830 | 2c31 | 2900 | 636f | 6170 | 6172 | 655f | 6461 | 7461 |
| 4357240 | 5f73 | 7472 | 7563 | 743a | 5428 | 302c | 3232 | 293d | 7338 | 6c65 | 6e67 | 7468 | 3a28 | 302c | 3129 | 2c30 | 2c33 | 323b | 7661 | 6c75 | 653a | 2830 | 2c31 | 292c |
| 4357320 | 3332 | 2c33 | 323b | 3b00 | 434f | 4d50 | 4152 | 455f | 4441 | 5441 | 3a74 | 2830 | 2c32 | 3229 | 0063 | 6f6d | 7061 | 7265 | 5f64 | 6174 | 613a | 7428 | 302c | 3233 |
| 4357400 | 293d | 2a28 | 302c | 3232 | 2900 | 7374 | 5f67 | 6574 | 5f6e | 6578 | 745f | 6669 | 656c | 643a | 6628 | 302c | 3232 | 2900 | 7465 | 7874 | 3a70 | 2830 | 2c31 | 3529 |
| 4357460 | 0072 | 6574 | 3a28 | 302c | 3232 | 2900 | 7374 | 5f63 | 6f6d | 7061 | 7265 | 5f6e | 6164 | 653a | 4628 | 302c | 3129 | 0073 | 313a | 7028 | 302c | 3135 | 2900 | 7332 |
| 4357540 | 3a70 | 2830 | 2c31 | 3529 | 0063 | 313a | 2830 | 2c32 | 3229 | 0063 | 323a | 2830 | 2c32 | 3229 | 0063 | 6d70 | 3a28 | 302c | 3129 | 0073 | 745f | 636f | 6d70 | 6172 |
| 4357620 | 655f | 7374 | 7269 | 6e67 | 3a46 | 2830 | 2c31 | 2900 | 7331 | 3a70 | 2830 | 2c31 | 3529 | 0073 | 323a | 7028 | 302c | 3135 | 2900 | 7374 | 5f63 | 6f6d | 7061 | 7265 |
| 4357700 | 5f6e | 6f63 | 6173 | 655f | 7374 | 7269 | 6e67 | 3a46 | 2830 | 2c31 | 2900 | 7331 | 3a70 | 2830 | 2c31 | 3529 | 0073 | 323a | 7028 | 302c | 3135 | 2900 | 7361 | 2e6f |
| 4357760 | 005f | 696f | 7374 | 7265 | 616d | 5f69 | 6e69 | 7400 | 2d6c | 6700 | 6c69 | 6267 | 2e73 | 0063 | 7479 | 7065 | 5f2e | 6f00 | 696f | 622e | 6f00 | 5f65 | 7465 | 7874 |
| 4360040 | 005f | 6564 | 6174 | 6100 | 5f65 | 6e64 | 0073 | 7461 | 7274 | 005f | 6d61 | 696e | 005f | 656e | 7669 | 726f | 6e00 | 5f5f | 5f73 | 7464 | 5f5f | 4d47 | 5f4d | 616e |
| 4360120 | 6167 | 6572 | 5f63 | 7878 | 5f67 | 6574 | 5f4d | 6f64 | 4765 | 6e5f | 436f | 6d70 | 5074 | 725f | 005f | 5f5f | 7374 | 695f | 5f4d | 475f | 4d61 | 6e61 | 6765 | 725f |
| 4360200 | 6378 | 785f | 6765 | 745f | 4d6f | 6447 | 656e | 5f43 | 6f61 | 7050 | 7472 | 5f00 | 5f5f | 5f73 | 7464 | 5f5f | 4465 | 7355 | 6e69 | 745f | 6378 | 785f | 494f | 4d5f |
| 4360260 | 005f | 5f5f | 7374 | 645f | 5f49 | 4f4d | 616e | 5f63 | 7878 | 5f49 | 4f41 | 7578 | 5f00 | 5f5f | 5f73 | 7469 | 5f5f | 4465 | 7355 | 6e69 | 745f | 6378 | 785f | 494f |
| 4360340 | 4d5f | 005f | 5f5f | 7374 | 695f | 5f49 | 4f4d | 616e | 5f63 | 7878 | 5f49 | 4f41 | 7578 | 5f00 | 5f5f | 5f73 | 7464 | 5f5f | 656e | 7469 | 7479 | 5f63 | 7878 | 5f73 |
| 4360420 | 6574 | 5f65 | 6e74 | 6974 | 795f | 7479 | 7065 | 5f00 | 5f5f | 5f73 | 7469 | 5f5f | 656e | 7469 | 7479 | 5f63 | 7878 | 5f73 | 6574 | 5f65 | 6e74 | 6974 | 795f | 7479 |
| 4360500 | 7065 | 5f00 | 5f5f | 5f73 | 7464 | 5f5f | 4e4f | 626a | 6563 | 745f | 6462 | 5f63 | 7878 | 5f5f | 5f63 | 745f | 005f | 5f5f | 7374 | 645f | 5f50 | 4c69 | 7374 | 5f64 |
| 4360560 | 625f | 6378 | 785f | 696e | 7365 | 7274 | 5f00 | 5f5f | 5f73 | 7469 | 5f5f | 4e4f | 626a | 6563 | 745f | 6462 | 5f63 | 7878 | 5f5f | 5f63 | 745f | 005f | 5f5f | 7374 |
| 4360640 | 695f | 5f50 | 4c69 | 7374 | 5f64 | 625f | 6378 | 785f | 696e | 7365 | 7274 | 5f00 | 5f5f | 5f73 | 7464 | 5f5f | 4c69 | 7374 | 5f64 | 625f | 6378 | 785f | 5f5f | 6474 |
| 4360720 | 5f00 | 5f5f | 5f73 | 7464 | 5f5f | 4d75 | 785f | 6378 | 785f | 7365 | 7449 | 6e64 | 6578 | 5f00 | 5f5f | 5f73 | 7469 | 5f5f | 4c69 | 7374 | 5f64 | 625f | 6378 | 785f |
| 4361000 | 5f5f | 6474 | 5f00 | 5f5f | 5f73 | 7469 | 5f5f | 4d75 | 785f | 6378 | 785f | 7365 | 7449 | 6e64 | 6578 | 5f00 | 5f5f | 6474 | 6f72 | 7300 | 5f5f | 6374 | 6f72 | 7300 |
| 4361060 | 5f5f | 5f73 | 7464 | 5f5f | 436f | 756e | 7465 | 725f | 6378 | 785f | 7365 | 7449 | 6e64 | 6578 | 5f00 | 5f5f | 5f73 | 7464 | 5f5f | 4465 | 636f | 6465 | 725f | 6378 |
| 4361140 | 785f | 7365 | 7449 | 6e64 | 6578 | 5f00 | 5f5f | 5f73 | 7464 | 5f5f | 4765 | 6e56 | 616c | 7565 | 5f63 | 7878 | 5f65 | 7870 | 6c61 | 696e | 5f00 | 5f5f | 5f73 | 7469 |

```
4361220  5f5f 436f 756e 7465 725f 6378 785f 7365 7449 6e64 6578 5f00 5f5f 5f73 7469 5f5f 4465 636f 6465 725f 6378 785f 7365 7449
4361300  6e64 6578 5f00 5f5f 5f73 7469 5f5f 4765 6e56 616c 7565 5f63 7878 5f65 7870 6c61 696e 5f00 5f5f 5f73 7464 5f5f 6174 7472
4361360  6962 7574 655f 6378 785f 005f 5f5f 7374 695f 5f61 7474 7269 6275 7465 5f63 7878 5f00 5f5f 5f73 7464 5f5f 4449 6372 656d
4361440  656e 746f 725f 6378 785f 7365 7449 6e64 6578 5f00 5f5f 5f73 7469 5f5f 4449 6372 656d 656e 746f 725f 6378 785f 7365 7449
4361520  6e64 6578 5f00 5f5f 5f73 7464 5f5f 4d47 5f53 7065 6369 6669 635f 6378 785f 7365 745f 7465 6368 6e6f 6c6f 6779 5f6e 616d
4361600  655f 005f 5f5f 7374 695f 5f4d 475f 5370 6563 6966 6963 5f63 7878 5f73 6574 5f74 6563 686e 6f6c 6f67 795f 6e61 6d65 5f00
4361660  5f5f 5f73 7464 5f5f 4669 666f 5f63 7878 5f73 6574 496e 6465 785f 005f 5f5f 7374 645f 5f4d 6f64 4765 6e5f 6378 785f 7465
4361740  6470 4d47 5f00 5f5f 5f73 7464 5f5f 7061 7261 6d65 7465 725f 6378 785f 6370 315f 005f 5f5f 7374 695f 5f46 6966 6f5f 6378
4362020  785f 7365 7449 6e64 6578 5f00 5f5f 5f73 7469 5f5f 4d6f 6447 656e 5f63 7878 5f74 656d 704d 475f 005f 5f5f 7374 695f 5f70
4362100  6172 616d 6574 6572 5f63 7878 5f63 7031 5f00 5f5f 5f73 7464 5f5f 416c 6c42 6c6f 636b 735f 6378 785f 6578 706c 6169 6e5f
4362160  005f 5f5f 7374 695f 5f41 6c6c 426c 6f63 6b73 5f63 7878 5f65 7870 6c61 696e 5f00 5f5f 5f73 7464 5f5f 5f5f 5f73 7472 6561
4362240  6d5f 7361 5f63 5f00 5f5f 5f73 7464 5f5f 626c 6f63 6b5f 6378 785f 5465 6d70 5f00 5f5f 5f73 7469 5f5f 5f5f 5f73 7472 6561
4362320  6d5f 7361 5f63 5f00 5f5f 5f73 7469 5f5f 626c 6f63 6b5f 6378 785f 5465 6d70 5f00 5f5f 5f73 7464 5f5f 416c 6c42 6c6f 636b
4362400  735f 315f 6378 785f 6c73 696e 6873 6869 645f 005f 5f5f 7374 645f 5f4f 626a 6563 745f 6462 5f63 7878 5f65 7272 6f72 4d65
4362460  6d6f 7279 5f00 5f5f 5f73 7469 5f5f 416c 6c42 6c6f 636b 735f 315f 6378 785f 6c73 696e 6873 6869 645f 005f 5f5f 7374 695f
4362540  5f4f 626a 6563 745f 6462 5f63 7878 5f65 7272 6f72 4d65 6d6f 7279 5f00 5f5f 5f73 7464 5f5f 4164 6465 725f 6378 785f 7365
4362620  7449 6e64 6578 5f00 5f5f 5f73 7464 5f5f 4669 6c65 556e 5f63 7878 5f65 7870 6c61 696e 5f00 5f5f 5f73 7469 5f5f 4164 6465
4362700  725f 6378 785f 7365 7449 6e64 6578 5f00 5f5f 5f73 7469 5f5f 4669 6c65 556e 5f63 7878 5f65 7870 6c61 696e 5f00 5f5f 5f73
4362760  7464 5f5f 6d61 696e 5f76 6578 5f63 7878 5f45 6e74 6974 795f 5479 7065 5f4e 616d 655f 005f 5f5f 7374 695f 5f6d 6169 6e5f
4363040  7665 785f 6378 785f 456e 7469 7479 5f54 7970 655f 4e61 6d65 5f00 5f6e 6578 7477 6f72 645f 5f33 696f 7300 5f50 7274 4572
4363120  7200 5f43 6f70 7946 696c 6554 6f45 6e64 5f5f 3130 494f 5f4d 616e 6167 6572 4676 005f 6f70 656e 7072 6f74 5f5f 3766 696c
4363200  6562 7566 005f 436f 7079 4669 6c65 546f 4b65 7957 5f5f 3130 494f 5f4d 616e 6167 6572 4650 6354 3100 5f69 6e69 7463 6f75
4363260  6e74 5f5f 3133 496f 7374 7265 616d 5f69 5e69 7400 5f43 6f70 7946 696c 6554 6f4c 696e 655f 5f31 3049 4f5f 4d61 6e61 6765
4363340  7246 6900 5f66 6c6f 6174 6669 656c 645f 5f33 696f 7300 5f53 7461 746d 656e 7448 616e 6465 6c65 725f 5f31 3049 4f5f 4d61
4363420  6e61 6765 7246 5063 5431 6900 5f73 7464 7374 6174 7573 5f5f 3133 496f 7374 7265 616d 5f69 6e69 7400 5f61 646a 7573 7466
4363500  6965 6c64 5f5f 3369 6f73 005f 494f 4368 6563 6b5f 5f31 3049 4f5f 4d61 6e61 6765 7246 7600 5f5f 5f63 745f 5f31 3049 4f5f
4363560  4d61 6e61 6765 7246 5063 005f 494f 4175 7800 5f49 4f5f 4275 6666 6572 005f 7374 6469 6f66 6c75 7368 5f5f 3369 6f73 005f
4363640  6e65 7874 6269 745f 5f33 696f 7300 5f73 7472 5f61 6c6c 6f63 005f 6f75 7443 6f6e 005f 494f 4175 7842 005f 494f 4275 6666
4363720  005f 7374 724c 6578 005f 4561 745f 5374 6174 656d 656e 745f 5f31 3049 4f5f 4d61 6e61 6765 7246 5063 5431 005f 494f 5f41
4364000  7578 6c72 7941 005f 494f 5f41 7578 6c72 7942 005f 6261 7365 6669 656c 645f 5f33 696f 7300 5f73 6574 5f47 656e 5661 6c75
4364060  655f 7479 7065 5f5f 3847 656e 5661 6c75 6546 5063 6900 5f5f 5f70 7462 6c5f 5f38 4c50 4f62 6a65 6374 5f5f 4765 6e56 616c
4364140  7565 5f63 7878 005f 5f5f 7674 626c 5f5f 384c 504f 626a 6563 745f 5f47 656e 5661 6c75 655f 6378 7800 5f5f 5f70 7462 6c5f
4364220  5f38 4765 6e56 616c 7565 5f5f 4765 6e56 616c 7565 5f63 7878 005f 5f5f 7674 626c 5f5f 3847 656e 5661 6c75 6500 5f56 616c
4364300  7565 5f54 7970 655f 4e61 6d65 005f 6578 706c 6169 6e5f 5f38 4765 6e56 616c 7565 4650 6300 5f5f 5f70 7462 6c5f 5f36 4f62
4364360  6a65 6374 5f5f 4765 6e56 616c 7565 5f63 7878 005f 6368 6563 6b5f 5f38 4765 6e56 616c 7565 4669 005f 5f5f 7674 626c 5f5f
4364440  364f 626a 6563 7400 5f5f 5f70 7462 6c5f 5f36 4f62 6a65 6374 5f5f 7061 7261 6d65 7465 725f 6378 7800 5f5f 5f70 7462 6c5f
4364520  5f36 4d6f 6447 656e 5f5f 7061 7261 6d65 7465 725f 6378 7800 5f5f 5f70 7462 6c5f 5f36 656e 7469 7479 5f5f 7061 7261 6d65
4364600  7465 725f 6378 7800 5f67 6574 5f70 6172 616d 6574 6572 5f50 5852 4546 5f5f 3970 6172 616d 6574 6572 4631 3050 6172 615f
4364660  436c 6173 7300 5f67 6574 5f56 4844 4c5f 466f 726d 616c 5f50 6172 616d 5f5f 3970 6172 616d 6574 6572 4650 6369 005f 6765
4364740  745f 5648 444c 5f50 726d 7472 5f5f 3970 6172 616d 6574 6572 4650 6369 005f 6c73 6961 626f 7274 005f 5f5f 7674 626c 5f5f
4365020  344c 6973 7400 5f69 646e 746e 005f 7465 6d70 005f 7365 745f 7061 7261 6d65 7465 725f 6d6f 6465 5f5f 3970 6172 616d 6574
4365100  6572 4650 6300 5f5f 5f63 745f 5f37 4e4f 626a 6563 7446 5063 005f 5648 444c 5f50 696e 5f54 7970 655f 4e61 6d65 005f 5f5f
4365160  7074 626c 5f5f 344c 6973 745f 5f70 6172 6163 6574 6572 5f63 7878 005f 5f5f 7074 626c 5f5f 384c 504f 626a 6563 745f 5f70
4365240  6172 616d 6574 6572 5f63 7878 005f 5f5f 7674 626c 5f5f 384c 504f 626a 6563 745f 5f70 6172 616d 6574 6572 5f63 7878 005f
4365320  5f5f 7074 626c 5f5f 3847 656e 5661 6c75 655f 5f70 6172 616d 6574 6572 5f63 7878 005f 5f5f 7674 626c 5f5f 3562 6c6f 636b
4365400  005f 5f5f 7674 626c 5f5f 3550 4c69 7374 005f 7365 745f 7061 7261 6d65 7465 725f 5058 5265 665f 5f39 7061 7261 6d65 7465
4365460  7246 5063 5035 626c 6f63 6b00 5f67 6574 5f56 4844 4c5f 4578 7061 6e64 6564 5f46 6f72 6d61 6c5f 5061 7261 6d5f 5f39 7061
4365540  7261 6d65 7465 7246 5035 626c 6f63 6b50 6369 005f 7465 6d70 3200 5f63 7031 005f 6370 3200 5f5f 5f76 7462 6c5f 5f39 7061
4365620  7261 6d65 7465 7200 5f69 6465 6e74 6174 696f 6e00 5f5f 5f70 7462 6c5f 5f35 626c 6f63 6b5f 5f70 6172 616d 6574 6572 5f63
4365700  7878 005f 5f5f 7074 626c 5f5f 3550 4c69 7374 5f5f 7061 7261 6d65 7465 725f 6378 7800 5f67 6574 5f56 4844 4c5f 4578 7061
4365760  6e64 6564 5f50 726d 7472 5f4d 6170 5f5f 3970 6172 616d 6574 6572 4650 3562 6c6f 636b 5063 6900 5f67 6574 5f63 6f72 7265
4366040  6374 5f6c 656e 6774 685f 5f39 7061 7261 6d65 7465 7246 7600 5f67 6574 5f50 696e 4c65 6e67 7468 5f5f 364d 6f64 4765 6e46
4366120  5063 005f 5f5f 7074 626c 5f5f 3970 6172 616d 6574 6572 5f5f 7061 7261 6d65 7465 725f 6378 7800 5f5f 5f76 7462 6c5f 5f36
4366200  4d6f 6447 656e 005f 5f5f 7674 626c 5f5f 3665 6e74 6974 7900 5f73 6574 5f70 6172 616d 6574 6572 5f73 7261 6e67 655f 5f39
4366260  7061 7261 6d65 7465 7246 5063 005f 5069 6e5f 5479 7065 5f4e 616d 6500 5f67 6574 5f70 6172 615f 6c65 6e67 7468 5f5f 3970
```

```
4366340 6172 616d 6574 6572 4676 005f 6765 745f 7061 7261 5f73 7461 7475 735f 5f39 7061 7261 6d65 7465 7246 7600 5f65 7870 6c61
4366420 696e 5f5f 3970 6172 616d 6574 6572 4650 6300 5f65 7870 6c61 696e 5f5f 3665 6e74 6974 7946 5063 005f 5f5f 7074 626c 5f5f
4366500 364f 626a 6563 745f 5f65 6e74 6974 795f 6378 7800 5f5f 5f70 7462 6c5f 5f36 656e 7469 7479 5f5f 656e 7469 7479 5f63 7878
4366560 005f 6973 4c54 455f 5f36 656e 7469 7479 4650 364f 626a 6563 7400 5f69 7347 5445 5f5f 3665 6e74 6974 7946 5036 4f62 6a65
4366640 6374 005f 456e 7469 7479 5f54 7970 655f 4e61 6165 005f 5f5f 7074 626c 5f5f 344c 6973 745f 5f65 6e74 6974 795f 6378 7800
4366720 5f73 6574 5f65 6e74 6974 795f 7479 7065 5f5f 3665 6e74 6974 7946 5063 005f 5f5f 7074 626c 5f5f 384c 504f 626a 6563 745f
4367000 5f65 6e74 6974 795f 6378 7800 5f5f 5f76 7462 6c5f 5f38 4c50 4f62 6a65 6374 5f5f 656e 7469 7479 5f63 7878 005f 5f5f 7074
4367060 626c 5f5f 3550 4c69 7374 5f5f 656e 7469 7479 5f63 7878 005f 5f5f 7074 626c 5f5f 364f 626a 6563 745f 5f61 7474 7269 6275
4367140 7465 5f63 7878 005f 5f5f 7074 626c 5f5f 3136 626c 6f63 6b5f 6174 7472 6962 7574 6573 5f5f 6174 7472 6962 7574 655f 6378
4367220 7800 5f5f 5f76 7462 6c5f 5f31 3662 6c6f 636b 5f61 7474 7269 6275 7465 735f 5f61 7474 7269 6275 7465 5f63 7878 005f 5f5f
4367300 7074 626c 5f5f 384c 504f 626a 6563 745f 5f61 7474 7269 6275 7465 5f63 7878 005f 5f5f 7674 626c 5f5f 384c 504f 626a 6563
4367360 745f 5f61 7474 7269 6275 7465 5f63 7878 005f 5f5f 7074 626c 5f5f 3847 656e 5661 6c75 655f 5f61 7474 7269 6275 7465 5f63
4367440 7878 005f 6973 4c54 455f 5f35 626c 6f63 6b46 5036 4f62 6a65 6374 005f 6973 4754 455f 5f35 626c 6f63 6b46 5036 4f62 6a65
4367520 6374 005f 426c 6f63 6b5f 5479 7065 5f4e 616d 6500 5f73 6574 5f62 6c6f 636b 5f74 7970 655f 5f35 626c 6f63 6b46 5063 005f
4367600 575f 434c 5f45 6e74 6974 7944 6563 5f5f 3562 6c6f 636b 4676 005f 575f 4d47 5f43 6865 636b 436f 6170 5f5f 3562 6c6f 636b
4367660 4676 005f 575f 5648 444c 5f43 6f6d 7044 6563 5f5f 3562 6c6f 636b 4676 005f 7365 7445 7272 6f72 5f5f 3562 6c6f 636b 4663
4367740 005f 6973 4d65 6162 6572 5f5f 3550 4c69 7374 4650 6300 5f43 6365 636b 5061 7261 6d4c 6973 745f 5f35 626c 6f63 6b46 5035
4370020 504c 6973 7400 5f5f 5f70 7462 6c5f 5f34 4c69 7374 5f5f 626c 6f63 6b5f 6378 7800 5f57 5f56 4844 4c5f 436f 6d70 496e 7374
4370100 5f5f 3562 6c6f 636b 4676 005f 746f 5f6c 6f77 6572 005f 5f5f 7074 626c 5f5f 384c 504f 626a 6563 745f 5f62 6c6f 636b 5f63
4370160 7878 005f 5f5f 7674 626c 5f5f 384c 504f 626a 6563 745f 5f62 6c6f 636b 5f63 7878 005f 5f5f 7074 626c 5f5f 3847 656e 5661
4370240 6c75 655f 5f62 6c6f 636b 5f63 7878 005f 5465 6470 005f 4275 6666 6572 005f 5f5f 7074 626c 5f5f 3562 6c6f 636b 5f5f 626c
4370320 6f63 6b5f 6378 7800 5f5f 5f70 7462 6c5f 5f35 504c 6973 745f 5f62 6c6f 636b 5f63 7878 005f 4368 6563 6b50 6172 614c 6973
4370400 7473 5f5f 3562 6c6f 636b 4676 005f 6765 745f 5648 444c 5f43 6f6d 704e 616d 655f 5f35 626c 6f63 6b46 5063 005f 575f 4d47
4370460 5f43 6f6d 7044 7363 7270 746e 5f5f 3562 6c6f 636b 4676 005f 5f5f 7074 626c 5f5f 3970 6172 616d 6574 6572 5f5f 626c 6f63
4370540 6b5f 6378 7800 5f69 7351 7561 6c69 6669 6564 5f5f 3562 6c6f 636b 4676 005f 6765 745f 4d6f 6447 656e 5f43 6f6d 7050 7472
4370620 5f5f 4650 6354 3100 5f67 6574 5f63 6f6d 705f 6c65 6e67 7468 5f5f 3562 6c6f 636b 4676 005f 6578 706c 6169 6e5f 5f35 504c
4370700 6973 7446 5063 005f 6578 706c 6169 6e5f 5f35 626c 6f63 6b46 5063 005f 575f 434c 5f41 7263 6842 6f64 795f 5f35 626c 6f63
4370760 6b46 7600 5f5f 5f70 7462 6c5f 5f36 4f62 6a65 6374 5f5f 626c 6f63 6b5f 6378 7800 5f5f 5f70 7462 6c5f 5f36 4d6f 6447 656e
4371040 5f5f 626c 6f63 6b5f 6378 7800 5f5f 5f70 7462 6c5f 5f36 656e 7469 7479 5f5f 626c 6f63 6b5f 6378 7800 5f67 6574 5f56 4844
4371120 4c5f 436f 6d70 4c61 626c 655f 5f35 626c 6f63 6b46 5063 005f 494f 4d00 5f5f 5f70 7462 6c5f 5f31 3662 6c6f 636b 5f61 7474
4371200 7269 6275 7465 735f 5f62 6c6f 636b 5f63 7878 005f 5f5f 7674 626c 5f5f 3136 626c 6f63 6b5f 6174 7472 6962 7574 6573 5f5f
4371260 626c 6f63 6b5f 6378 7800 5f5f 5f70 7462 6c5f 5f38 4c50 4f62 6a65 6374 5f5f 4465 7355 6e69 745f 6378 7800 5f5f 5f76 7462
4371340 6c5f 5f38 4c50 4f62 6a65 6374 5f5f 4465 7355 6e69 745f 6378 7800 5f5f 5f70 7462 6c5f 5f35 626c 6f63 6b5f 5f44 6573 556e
4371420 6974 5f63 7878 005f 5f5f 7074 626c 5f5f 3550 4c69 7374 5f5f 4465 7355 6e69 745f 6378 7800 5f5f 5f63 745f 5f31 3044 6573
4371500 6967 6e55 6e69 7446 5036 656e 7469 7479 005f 5f5f 7674 626c 5f5f 3130 4465 7369 676e 556e 6974 005f 4578 7061 6e64 5f56
4371560 4844 4c5f 4455 5f5f 3130 4465 7369 676e 556e 6974 4676 005f 5f5f 7074 626c 5f5f 364f 626a 6563 745f 5f44 6573 556e 6974
4371640 5f63 7878 005f 5f5f 7074 626c 5f5f 364d 6f64 4765 6e5f 5f44 6573 556e 6974 5f63 7878 005f 5f5f 7074 626c 5f5f 3665 6e74
4371720 6974 795f 5f44 6573 556e 6974 5f63 7878 005f 6973 4c54 455f 5f31 3044 6573 6967 6e55 6e69 7446 5036 4f62 6a65 6374 005f
4372000 6973 4754 455f 5f31 3044 6573 6967 6e55 6e69 7446 5036 4f62 6a65 6374 005f 7365 744e 616d 655f 5f37 4e4f 626a 6563 7446
4372060 5063 005f 4571 7561 6c5f 5f31 3044 6573 6967 6e55 6e69 7446 5036 656e 7469 7479 005f 5f5f 7074 626c 5f5f 3130 4465 7369
4372140 676e 556e 6974 5f5f 4465 7355 6e69 745f 6378 7800 5f5f 5f70 7462 6c5f 5f34 4c69 7374 5f5f 4465 7355 6e69 745f 6378 7800
4372220 5f5f 5f70 7462 6c5f 5f36 4f62 6a65 6374 5f5f 4669 6c65 556e 5f63 7878 005f 5f5f 7074 626c 5f5f 364d 6f64 4765 6e5f 5f46
4372300 696c 6555 6e5f 6378 7800 5f5f 5f70 7462 6c5f 5f36 656e 7469 7479 5f5f 4669 6c65 556e 5f63 7878 005f 5f5f 7674 626c 5f5f
4372360 3846 696c 6555 6e69 7400 5f45 7870 616e 645f 5648 444c 5f44 555f 5f38 4669 6c65 556e 6974 4676 005f 5f5f 7074 626c 5f5f
4372440 3130 4465 7369 676e 556e 6974 5f5f 4669 6c65 556e 5f63 7878 005f 5f5f 7074 626c 5f5f 344c 6973 745f 5f46 696c 6555 6e5f
4372520 6378 7800 5f65 7870 6c61 696e 5f5f 3846 696c 6555 6e69 7446 5063 005f 5f5f 7074 626c 5f5f 384c 504f 626a 6563 745f 5f46
4372600 696c 6555 6e5f 6378 7800 5f5f 5f76 7462 6c5f 5f38 4c50 4f62 6a65 6374 5f5f 4669 6c65 556e 5f63 7878 005f 5f5f 7074 626c
4372660 5f5f 3846 696c 6555 6e69 745f 5f46 696c 6555 6e5f 6378 7800 5f5f 5f70 7462 6c5f 5f35 626c 6f63 6b5f 5f46 696c 6555 6e5f
4372740 6378 7800 5f5f 5f70 7462 6c5f 5f35 504c 6973 745f 5f46 696c 6555 6e5f 6378 7800 5f52 6576 6572 7365 5061 7261 6d4c 6973
4373020 7473 5f5f 3941 6c6c 426c 6f63 6b73 4676 005f 6d61 6b65 5f46 554c 6973 745f 5f39 416c 6c42 6c6f 636b 7346 7600 5f6d 616b
4373100 655f 4455 4c69 7374 5f5f 3941 6c6c 426c 6f63 6b73 4676 005f 5f5f 7074 626c 5f5f 364d 6f64 4765 6e5f 5f41 6c6c 426c 6f63
4373160 6b73 5f63 7878 005f 5f5f 7074 626c 5f5f 364f 626a 6563 745f 5f41 6c6c 426c 6f63 6b73 5f63 7878 005f 5f5f 7074 626c 5f5f
4373240 3665 6e74 6974 795f 5f41 6c6c 426c 6f63 6b73 5f63 7878 005f 5f5f 7074 626c 5f5f 3130 4465 7369 676e 556e 6974 5f5f 416c
4373320 6c42 6c6f 636b 735f 6378 7800 5f5f 5f70 7462 6c5f 5f34 4c69 7374 5f5f 416c 6c42 6c6f 636b 735f 6378 7800 5f5f 5f76 7462
4373400 6c5f 5f38 4c50 4f62 6a65 6374 5f5f 416c 6c42 6c6f 636b 735f 6378 7800 5f5f 5f70 7462 6c5f 5f38 4669 6c65 556e 6974 5f5f
```

```
4373460  416c 6c42 6c6f 636b 735f 6378 7800 5f5f 5f70 7462 6c5f 5f38 4c50 4f62 6a65 6374 5f5f 416c 6c42 6c6f 636b 735f 6378 7800
4373540  5f5f 5f76 7462 6c5f 5f39 416c 6c42 6c6f 636b 7300 5f5f 5f70 7462 6c5f 5f35 626c 6f63 6b5f 5f41 6c6c 426c 6f63 6b73 5f63
4373620  7878 005f 5f5f 7074 626c 5f5f 3550 4c69 7374 5f5f 416c 6c42 6c6f 636b 735f 6378 7800 5f45 7870 616e 645f 5648 444c 5f46
4373700  555f 5f39 416c 6c42 6c6f 636b 7346 7600 5f5f 5f70 7462 6c5f 5f39 416c 6c42 6c6f 636b 735f 5f41 6c6c 426c 6f63 6b73 5f63
4373760  7878 005f 696e 7365 7274 5f5f 3550 4c69 7374 4650 384c 504f 626a 6563 7400 5f72 6576 6572 7365 5f5f 3550 4c69 7374 4676
4374040  005f 536f 7274 5f50 4c69 7374 5f5f 3550 4c69 7374 4669 005f 6578 706c 6169 6e5f 5f39 416c 6c42 6c6f 636b 7346 5063 005f
4374120  6c65 786f 7065 6e00 5f5f 5f70 7462 6c5f 5f34 4c69 7374 5f5f 416c 6c42 6c6f 636b 735f 315f 6378 7800 5f5f 5f76 7462 6c5f
4374200  5f38 4c50 4f62 6a65 6374 5f5f 416c 6c42 6c6f 636b 735f 315f 6378 7800 5f5f 5f70 7462 6c5f 5f38 4669 6c65 556e 6974 5f5f
4374260  416c 6c42 6c6f 636b 735f 315f 6378 7800 5f5f 5f70 7462 6c5f 5f39 4c50 4f62 6a65 6374 5f5f 416c 6c42 6c6f 636b 735f 315f
4374340  6378 7800 5f5f 5f70 7462 6c5f 5f38 4765 6e56 616c 7565 5f5f 416c 6c42 6c6f 636b 735f 315f 6378 7800 5f6c 6e75 6d00 5f72
4374420  6561 645f 7661 6c75 655f 5f46 6954 3150 6300 5f50 4572 726f 725f 5f46 6954 3150 6300 5f41 005f 4200 5f52 6561 645f 5648
4374500  444c 5f42 6c6b 4669 6c65 5f5f 3341 6c6c 426c 6f63 6b73 4650 6300 5f6c 6578 7265 7377 6400 5f6c 6578 5f66 696c 6500 5f6c
4374560  6578 7175 6f74 6500 5f5f 5f70 7462 6c5f 5f35 626c 6f63 6b5f 5f41 6c6c 426c 6f63 6b73 5f31 5f63 7878 005f 5f5f 7074 626c
4374640  5f5f 3550 4c69 7374 5f5f 416c 6c42 6c6f 636b 735f 315f 6378 7800 5f45 005f 7265 6164 5f74 7970 655f 5f46 6950 6300 5f74
4374720  7374 7200 5f5f 5f70 7462 6c5f 5f39 416c 6c42 6c6f 636b 735f 5f41 6c6c 426c 6f63 6b73 5f31 5f63 7878 005f 5f5f 7074 626c
4375000  5f5f 3970 6172 616d 6574 6572 5f5f 416c 6c42 6c6f 636b 735f 315f 6378 7800 5f74 6f5f 7570 7065 7200 5f4c 005f 6d61 5f63
4375060  7572 7265 6e74 5f67 726f 7570 005f 6c65 7863 7265 6174 6500 5f5f 5f70 7462 6c5f 5f36 4d6f 6447 656e 5f5f 416c 6c42 6c6f
4375140  636b 735f 315f 6378 7800 5f5f 5f70 7462 6c5f 5f36 4f62 6a65 6374 5f5f 416c 6c42 6c6f 636b 735f 315f 6378 7800 5f5f 5f70
4375220  7462 6c5f 5f36 656e 7469 7479 5f5f 416c 6c42 6c6f 636b 735f 315f 6378 7800 5f50 005f 5f5f 7674 626c 5f5f 3136 626c 6f63
4375300  6b5f 6174 7472 6962 7574 6573 5f5f 416c 6c42 6c6f 636b 735f 315f 6378 7800 5f5f 5f70 7462 6c5f 5f31 3662 6c6f 636b 5f61
4375360  7474 7269 6275 7465 735f 5f41 6c6c 426c 6f63 6b73 5f31 5f63 7878 005f 6c65 7867 6574 005f 5600 5f6c 6578 6c69 6e65 7661
4375440  7200 5f5f 5f70 7462 6c5f 5f31 3044 6573 6967 6e55 6e69 745f 5f41 6c6c 426c 6f63 6b73 5f31 5f63 7878 005f 5f5f 7074 626c
4375520  5f5f 3130 4465 7369 676e 556e 6974 5f5f 6d61 696e 5f76 6578 5f63 7878 005f 5f5f 7074 626c 5f5f 344c 6973 745f 5f6d 6169
4375600  6e5f 7665 785f 6378 7800 5f42 7566 6665 725f 4172 7261 7900 5f5f 5f70 7462 6c5f 5f38 4c50 4f62 6a65 6374 5f5f 6d61 696e
4375660  5f76 6578 5f63 7878 005f 5f5f 7674 626c 5f5f 394c 504f 626a 6563 745f 5f6d 6169 6e5f 7665 785f 6378 7800 5f5f 5f70 7462
4375740  6c5f 5f38 4765 6e56 616c 7565 5f5f 6d61 696e 5f76 6578 5f63 7878 005f 5f5f 7074 625c 5f5f 3846 696c 6555 6e69 745f 5f6d
4376020  6169 6e5f 7665 785f 6378 7800 5f5f 5f64 745f 5f34 4c69 7374 4676 005f 5f5f 7074 626c 5f5f 3562 6c6f 636b 5f5f 6d61 696e
4376100  5f76 6578 5f63 7878 005f 5f5f 7074 626c 5f5f 3550 4c69 7374 5f5f 6d61 696e 5f76 6578 5f63 7878 005f 7365 745f 7465 6368
4376160  6e6f 6c6f 6779 5f6e 616d 655f 5f31 314d 475f 5370 6563 6966 6963 4650 6300 5f50 6172 615f 436c 6173 735f 4e61 6d65 005f
4376240  5f5f 7074 626c 5f5f 3970 6172 616d 6574 6572 5f5f 6d61 696e 5f76 6578 5f63 7878 005f 5f5f 7074 626c 5f5f 3941 6c6c 426c
4376320  6f63 6b73 5f5f 6161 696e 5f76 6578 5f63 7878 005f 5f5f 7074 626c 5f5f 364f 626a 6563 745f 5f6d 6169 6e5f 7665 785f 6378
4376400  7800 5f5f 5f70 7462 6c5f 5f36 4d6f 6447 656e 5f5f 6d61 696e 5f76 6578 5f63 7878 005f 5f5f 7074 626c 5f5f 3665 6e74 6974
4376460  795f 5f6d 6169 6e5f 7665 785f 6378 7800 5f4d 4700 5f5f 5f70 7462 6c5f 5f31 3662 6c6f 636b 5f61 7474 7269 6275 7465 735f
4376540  5f6d 6169 6e5f 7665 785f 6378 7800 5f5f 5f76 7462 6c5f 5f31 3662 6c6f 636b 5f61 7474 7269 6275 7465 735f 5f6d 6169 6e5f
4376620  7665 785f 6378 7800 5f45 7272 6f72 4275 6666 6572 005f 615f 7965 7300 5f74 5f6e 6f00 5f6c 6578 6c65 7474 6572 005f 745f
4376700  7965 7300 5f5f 6374 7970 655f 005f 7965 736e 6f00 5f6c 6578 5f73 7472 696e 6700 5f61 5f6e 6f00 5f5f 5f70 7462 6c5f 5f36
4376760  4f62 6a65 6374 5f5f 4e4f 626a 6563 745f 6462 5f63 7878 005f 5f5f 7674 626c 5f5f 374e 4f62 6a65 6374 5f5f 4e4f 626a 6563
4377040  745f 6462 5f63 7878 005f 5f5f 7074 626c 5f5f 374e 4f62 6a65 6374 5f5f 4e4f 626a 6563 745f 6462 5f63 7878 005f 6572 726f
4377120  724d 656d 6f72 795f 5f36 4f62 6a65 6374 4650 6354 3100 5f5f 5f70 7462 6c5f 5f36 4f62 6a65 6374 5f5f 4f62 6a65 6374 5f64
4377200  625f 6378 7800 5f65 7870 6c61 696e 5f5f 364f 626a 6563 7446 5063 005f 6973 4571 7561 6c5f 5f35 504c 6973 7446 5234 4c69
4377260  7374 005f 696e 7365 7274 5f5f 3550 4c69 7374 4652 3550 4c69 7374 005f 7265 6d6f 7665 5f5f 3550 4c69 7374 4650 384c 504f
4377340  626a 6563 7400 5f69 734d 656d 6265 725f 5f35 504c 6973 7446 5037 4c4f 626a 6563 7400 5f5f 5f70 7462 6c5f 5f34 4c69 7374
4377420  5f5f 504c 6973 745f 6462 5f63 7878 005f 5f5f 7674 626c 5f5f 384c 504f 626a 6563 745f 5f50 4c69 7374 5f64 625f 6378 7800
4377500  5f5f 5f70 7462 6c5f 5f38 4c50 4f62 6a65 6374 5f5f 504c 6973 745f 6462 5f63 7878 005f 696e 7365 7274 5f5f 344c 6973 7446
4377560  5037 4c4f 626a 6563 7400 5f5f 5f70 7462 6c5f 5f35 504c 6973 745f 5f50 4c69 7374 5f64 625f 6378 7800 5f5f 5f70 7462 6c5f
4377640  5f36 4f62 6a65 6374 5f5f 504c 6973 745f 6462 5f63 7878 005f 696e 7365 7274 4166 7465 725f 5f35 504c 6973 7446 5038 4c50
4377720  4f62 6a65 6374 5431 005f 7265 6d6f 7665 5f5f 3550 4c69 7374 4650 6300 5f5f 5f70 7462 6c5f 5f38 4c50 4f62 6a65 6374 5f5f
4400000  4c69 7374 5f64 625f 6378 7800 5f5f 5f76 7462 6c5f 5f38 4c50 4f62 6a65 6374 5f5f 4c69 7374 5f64 625f 6378 7800 5f65 7272
4400060  6f72 4d65 6d6f 7279 5f5f 344c 6973 7446 5063 5431 005f 5f5f 7074 626c 5f5f 364f 626a 6563 745f 5f4c 6973 745f 6462 5f63
4400140  7878 005f 6578 706c 6169 6e5f 5f34 4c69 7374 4650 6300 5f62 726f 6164 6361 7374 5f5f 344c 6973 7446 4d36 4f62 6a65 6374
4400220  4676 5f76 005f 5f5f 7074 626c 5f5f 344c 6973 745f 5f4c 6973 745f 6462 5f63 7878 005f 6c73 7466 696c 6500 5f6c 696e 656e
4400300  756d 005f 6c73 746f 7065 6e00 5f6c 7374 7075 7473 005f 6c73 6965 7863 7400 5f77 6172 6e75 6d00 5f62 726f 7773 656c 6600
4400360  5f6e 6577 6c69 6e65 005f 6e65 7770 6167 6500 5f6f 7074 5f73 6574 005f 7072 7468 6561 6400 5f70 7274 6573 756d 005f 7061
4400440  6765 6e75 6d00 5f6c 7369 786f 6e61 626f 7274 005f 6669 6e61 6c61 7564 005f 6669 6c65 6e61 6d65 005f 6670 7274 6c69 6e65
4400520  005f 6c69 7374 005f 7365 7272 6e75 6d00 5f69 6e69 7474 696d 6500 5f69 6e69 7472 6169 6c00 5f69 736e 756d 6265 7200 5f74
```

| | | | | | | | | | | | | | | | | | | | | | | | | |
|---|---|---|---|---|---|---|---|---|---|---|---|---|---|---|---|---|---|---|---|---|---|---|---|---|
| 4400600 | 6f74 | 7469 | 6d65 | 005f | 746f | 7465 | 7375 | 6d00 | 5f74 | 6572 | 726e | 7561 | 005f | 7477 | 6172 | 6e75 | 6d00 | 5f74 | 696e | 666e | 756d | 005f | 7072 | 7464 |
| 4400660 | 656c | 7461 | 6275 | 6600 | 5f63 | 6461 | 7465 | 005f | 6f75 | 745f | 6f66 | 5f6d | 656d | 6f72 | 795f | 6675 | 6e63 | 7469 | 6f6e | 005f | 7670 | 7269 | 6e74 | 6600 |
| 4400740 | 5f76 | 7072 | 7465 | 7272 | 005f | 7670 | 7574 | 6572 | 7200 | 5f6c | 7374 | 636c | 6f73 | 6500 | 5f6c | 7374 | 5f74 | 7970 | 6500 | 5f6c | 696e | 6566 | 6c61 | 6700 |
| 4401020 | 5f6c | 7374 | 666c | 7573 | 6800 | 5f6c | 7369 | 656e | 7466 | 6e00 | 5f6c | 7369 | 656e | 7465 | 7200 | 5f6c | 696e | 6567 | 6e63 | 7200 | 5f6c | 7374 | 7072 | 696e |
| 4401100 | 7400 | 5f6c | 696e | 6574 | 636e | 7400 | 5f6d | 656d | 5f75 | 7365 | 6400 | 5f6d | 6f6e | 5f69 | 6e69 | 7400 | 5f6e | 6577 | 7469 | 746c | 6500 | 5f64 | 6566 | 6f70 |
| 4401160 | 7469 | 6f6e | 005f | 6f70 | 7474 | 7261 | 696c | 005f | 696e | 7075 | 7400 | 5f65 | 6c73 | 7466 | 6c75 | 7368 | 005f | 7061 | 6765 | 666c | 6167 | 005f | 6669 | 6e69 |
| 4401240 | 746c | 696e | 6500 | 5f6c | 6f70 | 656e | 005f | 7761 | 726e | 005f | 736c | 7072 | 696e | 7466 | 005f | 7473 | 6572 | 726e | 756d | 005f | 6464 | 6e61 | 6d65 | 005f |
| 4401320 | 6470 | 7061 | 6765 | 005f | 7666 | 7072 | 696e | 7466 | 005f | 7673 | 7072 | 696e | 7466 | 005f | 6572 | 726e | 756d | 005f | 6c73 | 696f | 7074 | 696f | 6e00 | 5f6c |
| 4401400 | 6578 | 5f6c | 7369 | 696f | 005f | 666c | 6f70 | 656e | 005f | 6770 | 6672 | 6565 | 005f | 636c | 6f73 | 6574 | 7261 | 696c | 005f | 6e65 | 7763 | 6f6c | 756d | 6e00 |
| 4401460 | 5f73 | 7461 | 7473 | 005f | 7365 | 7272 | 7300 | 5f69 | 6e66 | 6e75 | 6d00 | 5f69 | 6e6f | 7065 | 6e00 | 5f69 | 6e64 | 6973 | 7300 | 5f6d | 656d | 5f61 | 6c6c | 6f63 |
| 4401540 | 6174 | 6564 | 005f | 6d65 | 6d5f | 6578 | 6d61 | 7573 | 7465 | 6400 | 5f72 | 6573 | 6574 | 6865 | 6164 | 005f | 6c63 | 6c6f | 7365 | 005f | 696e | 6363 | 6863 | 6f75 |
| 4401620 | 6e74 | 005f | 6365 | 6e74 | 6572 | 3100 | 5f74 | 7479 | 6f75 | 7470 | 7574 | 005f | 6f75 | 7470 | 7574 | 005f | 766c | 7374 | 7072 | 696e | 7400 | 5f70 | 7574 | 6275 |
| 4401700 | 6600 | 5f70 | 7274 | 6572 | 7200 | 5f70 | 7574 | 6572 | 7200 | 5f61 | 7564 | 6974 | 5f74 | 7261 | 696c | 005f | 5f69 | 6f62 | 005f | 666f | 706e | 616d | 6500 | 5f71 |
| 4401760 | 616c | 6c6f | 6300 | 5f67 | 7061 | 6c6c | 6f63 | 005f | 6e65 | 7774 | 7261 | 696c | 6572 | 005f | 696e | 636c | 6f73 | 6500 | 5f70 | 7269 | 6e74 | 7472 | 6169 | 6c00 |
| 4402040 | 5f63 | 6f70 | 7900 | 5f72 | 7365 | 7473 | 7670 | 676e | 6f00 | 5f65 | 7272 | 7300 | 5f70 | 6f73 | 5f61 | 7267 | 005f | 666f | 705f | 6669 | 6c65 | 005f | 6466 | 6c6f |
| 4402120 | 7074 | 696f | 6e00 | 5f73 | 6574 | 6f70 | 7469 | 6f6e | 005f | 7265 | 6164 | 5f6f | 7074 | 6162 | 6c65 | 7300 | 5f66 | 6f70 | 5f6d | 6f64 | 005f | 7265 | 616c | 7469 |
| 4402200 | 6d00 | 5f6d | 6172 | 6b74 | 696d | 6500 | 5f63 | 7075 | 7469 | 6d00 | 5f74 | 6d61 | 726b | 7469 | 6d65 | 005f | 6c69 | 6266 | 696c | 6500 | 5f6d | 6c63 | 6c6f | 7365 |
| 4402260 | 005f | 7075 | 7474 | 7374 | 7200 | 5f66 | 6175 | 646e | 616d | 6500 | 5f66 | 6175 | 6464 | 6174 | 6500 | 5f66 | 6f70 | 7772 | 6974 | 6500 | 5f66 | 696c | 656f | 7065 |
| 4402340 | 6e00 | 5f66 | 6175 | 6468 | 6973 | 7400 | 5f66 | 696c | 6568 | 6973 | 7400 | 5f67 | 656e | 5f6d | 656d | 6200 | 5f67 | 656e | 5f66 | 696c | 6500 | 5f68 | 6173 | 686e |
| 4402420 | 616d | 6500 | 5f70 | 6172 | 7365 | 5f74 | 7261 | 696c | 005f | 6669 | 6e66 | 6f00 | 5f6d | 6175 | 6464 | 6174 | 6500 | 5f6d | 656d | 625f | 706f | 7300 | 5f6d | 6175 |
| 4402500 | 6468 | 6973 | 7400 | 5f6d | 656d | 6268 | 6973 | 7400 | 5f63 | 6872 | 6f6e | 6d65 | 6d62 | 005f | 6e69 | 6365 | 6461 | 7465 | 005f | 6e65 | 7874 | 5f73 | 7472 | 005f |
| 4402560 | 6368 | 6563 | 6b5f | 7465 | 726d | 5f63 | 6f6c | 6c69 | 7369 | 6f6c | 005f | 6667 | 6574 | 7472 | 6169 | 6c00 | 5f67 | 656e | 5f74 | 7261 | 696c | 005f | 7265 | 7674 |
| 4402640 | 7261 | 696c | 005f | 6175 | 646c | 6962 | 005f | 6d70 | 7574 | 6300 | 5f6d | 6765 | 7463 | 005f | 6d6f | 7065 | 6e00 | 5f6d | 696e | 666f | 005f | 6c73 | 6963 | 686b |
| 4402720 | 7375 | 6d00 | 5f6d | 6765 | 7474 | 7261 | 696c | 005f | 6d65 | 6162 | 7472 | 6169 | 6c00 | 5f70 | 6172 | 7365 | 5f6c | 6962 | 005f | 7061 | 7273 | 655f | 6f70 | 7400 |
| 4403000 | 5f43 | 4c4e | 414d | 4500 | 5f66 | 696c | 655f | 6175 | 6469 | 7400 | 5f61 | 7564 | 6d65 | 6d62 | 005f | 6175 | 6466 | 696c | 6500 | 5f73 | 616d | 6574 | 7261 | 696c |
| 4403060 | 005f | 6d63 | 6c6f | 7365 | 005f | 6d72 | 6461 | 7465 | 005f | 6d6c | 6f70 | 656e | 005f | 7472 | 696d | 7472 | 6169 | 6c00 | 5f74 | 7269 | 6d5f | 6c69 | 7374 | 005f |
| 4403140 | 6465 | 6c74 | 7374 | 7200 | 5f54 | 4e41 | 4d45 | 005f | 666f | 7072 | 6561 | 6400 | 5f66 | 666c | 6f70 | 656e | 005f | 6765 | 6e5f | 6c69 | 6200 | 5f67 | 6574 | 7473 |
| 4403220 | 7472 | 005f | 6765 | 6e5f | 6f70 | 7400 | 5f72 | 6c6f | 7065 | 6e00 | 5f6e | 6578 | 745f | 746c | 6973 | 7400 | 5f65 | 7870 | 616e | 6474 | 7261 | 696c | 005f | 7061 |
| 4403300 | 7273 | 655f | 6d65 | 6162 | 005f | 7061 | 7273 | 655f | 6669 | 6c65 | 005f | 666f | 726d | 6174 | 7472 | 6169 | 6c00 | 5f72 | 6d5f | 6669 | 6c65 | 005f | 636f | 6e73 |
| 4403360 | 7465 | 7100 | 5f69 | 7365 | 7175 | 616c | 005f | 7368 | 6173 | 6869 | 6e73 | 6572 | 7400 | 5f73 | 6d61 | 6b65 | 7461 | 6200 | 5f73 | 6861 | 7368 | 6765 | 7400 | 5f68 |
| 4403440 | 7368 | 6873 | 6862 | 6c6f | 636b | 005f | 6d61 | 5f66 | 7265 | 6500 | 5f67 | 6d61 | 6b65 | 7461 | 6200 | 5f67 | 6861 | 7368 | 6163 | 7400 | 5f67 | 6861 | 7368 | 6765 |
| 4403520 | 7400 | 5f70 | 6861 | 7368 | 6465 | 6c65 | 7465 | 005f | 7068 | 6173 | 6869 | 6e73 | 6572 | 7400 | 5f68 | 745f | 6765 | 745f | 6e65 | 7874 | 5f65 | 6c65 | 6d65 | 6e74 |
| 4403600 | 005f | 6768 | 6173 | 6861 | 6e61 | 6c79 | 7a65 | 005f | 7363 | 6173 | 6864 | 656c | 6574 | 6500 | 5f6d | 615f | 616c | 6c6f | 6300 | 5f70 | 6d61 | 6b65 | 7461 | 6200 |
| 4403660 | 5f70 | 6861 | 7368 | 6163 | 7400 | 5f70 | 6861 | 7368 | 6765 | 7400 | 5f6d | 615f | 706f | 705f | 6772 | 6f75 | 7000 | 5f67 | 626d | 616b | 6574 | 6162 | 005f | 7368 |
| 4403740 | 6173 | 6861 | 6374 | 005f | 7068 | 6173 | 6861 | 6e61 | 6c79 | 7a65 | 005f | 6874 | 5f6d | 616b | 655f | 7461 | 626c | 6500 | 5f68 | 745f | 6973 | 5f65 | 6c65 | 6d65 |
| 4404020 | 6e74 | 005f | 7368 | 6173 | 6861 | 6e61 | 6c79 | 7a65 | 005f | 7062 | 6d61 | 6b65 | 7461 | 6200 | 5f68 | 745f | 6465 | 6c65 | 7465 | 5f65 | 6c65 | 6d65 | 6e74 | 005f |
| 4404100 | 6874 | 5f69 | 6e73 | 6572 | 745f | 656c | 656d | 656e | 7400 | 5f6d | 615f | 7075 | 7369 | 5f67 | 726f | 7570 | 005f | 6e6f | 6370 | 7968 | 7368 | 626c | 6f63 | 6b00 |
| 4404160 | 5f6e | 6f66 | 7265 | 6873 | 6862 | 6c6f | 636b | 005f | 7362 | 6d61 | 6b65 | 7461 | 6200 | 5f68 | 745f | 6d61 | 6b65 | 5f70 | 6f69 | 6e74 | 6572 | 5f74 | 6162 | 6c65 |
| 4404240 | 005f | 6874 | 5f67 | 6574 | 5f65 | 6c65 | 6d65 | 6e74 | 005f | 636d | 7068 | 7368 | 626c | 6f63 | 6b00 | 5f63 | 7079 | 6873 | 6862 | 6c6f | 636b | 005f | 6672 | 6568 |
| 4404320 | 7368 | 626c | 6f63 | 6b00 | 5f67 | 6861 | 7368 | 6465 | 6c65 | 7465 | 005f | 6768 | 6173 | 6869 | 6e73 | 6572 | 7400 | 5f6c | 6962 | 7472 | 6f6e | 005f | 6d75 | 6e67 |
| 4404400 | 6574 | 6300 | 5f6d | 6465 | 6c65 | 7465 | 005f | 6d70 | 7269 | 6e74 | 6600 | 5f6c | 6962 | 6c65 | 7373 | 6600 | 5f6c | 6962 | 736f | 7065 | 6e00 | 5f6c | 6973 | 7473 |
| 4404460 | 6f72 | 7400 | 5f6c | 6962 | 6372 | 7970 | 7400 | 5f73 | 6574 | 6d65 | 6d62 | 6461 | 7465 | 005f | 6d65 | 6d62 | 6461 | 7465 | 005f | 6d65 | 6d62 | 6475 | 6d70 | 005f |
| 4404540 | 6670 | 5f61 | 6374 | 7561 | 6c00 | 5f6c | 7369 | 7a65 | 005f | 6c6e | 616d | 6500 | 5f63 | 6772 | 6162 | 005f | 6d72 | 6561 | 6400 | 5f6c | 6962 | 7265 | 6173 | 6f6e |
| 4404620 | 005f | 6c69 | 6263 | 6f6d | 7061 | 7400 | 5f6d | 7772 | 6974 | 6500 | 5f6c | 6578 | 5f6d | 656d | 6265 | 7200 | 5f66 | 6f70 | 5f70 | 6964 | 005f | 6c69 | 625f | 6672 |
| 4404700 | 6565 | 5f62 | 7974 | 6573 | 005f | 6670 | 5f65 | 7870 | 6563 | 7465 | 6400 | 5f6c | 6578 | 6772 | 6162 | 005f | 6c65 | 786c | 6f61 | 6400 | 5f6c | 6578 | 6368 | 6172 |
| 4404760 | 005f | 6c65 | 7877 | 6f72 | 6b66 | 756e | 6300 | 5f6c | 6578 | 6c63 | 6861 | 7200 | 5f6c | 6578 | 756e | 6172 | 7900 | 5f6c | 6578 | 5f74 | 6572 | 6d69 | 6e61 | 6c00 |
| 4405040 | 5f6c | 6578 | 7265 | 6173 | 6f6e | 005f | 6c65 | 7872 | 776f | 7264 | 7300 | 5f6c | 6578 | 6e6f | 6e65 | 7374 | 005f | 6c65 | 7865 | 7272 | 6675 | 6e63 | 005f | 6c65 |
| 4405120 | 7863 | 6f64 | 656e | 756d | 005f | 6c65 | 7869 | 6e73 | 656e | 7369 | 7469 | 7665 | 005f | 666f | 7073 | 7461 | 7465 | 005f | 666f | 705f | 6361 | 7365 | 005f | 666f |
| 4405200 | 705f | 7469 | 6d65 | 005f | 666f | 705f | 7465 | 6368 | 005f | 666f | 705f | 6174 | 7472 | 005f | 666f | 705f | 6163 | 6374 | 005f | 666f | 7073 | 686f | 7274 | 6e61 |
| 4405260 | 6d65 | 005f | 666f | 705f | 7973 | 697a | 6500 | 5f66 | 6f70 | 5f78 | 7369 | 7a65 | 005f | 666f | 705f | 7472 | 6163 | 6500 | 5f66 | 6f70 | 5f64 | 6965 | 005f | 666f |
| 4405340 | 705f | 7072 | 6500 | 5f66 | 6f70 | 5f73 | 7566 | 005f | 666f | 705f | 7665 | 7200 | 5f66 | 6f70 | 5f69 | 6f70 | 6974 | 6368 | 005f | 6568 | 5f70 | 7573 | 685f | 6861 |
| 4405420 | 6e64 | 6c65 | 7200 | 5f6d | 615f | 6770 | 616c | 5f68 | 616e | 646c | 6572 | 005f | 7a71 | 616c | 6c6f | 6300 | 5f6d | 615f | 6d65 | 6d5f | 616c | 6c6f | 6361 | 7465 |
| 4405500 | 6400 | 5f6d | 615f | 7a61 | 6c6c | 6f63 | 005f | 6d61 | 5f76 | 6572 | 6966 | 7900 | 5f65 | 685f | 7061 | 7373 | 5f65 | 7863 | 6570 | 7469 | 6f6e | 005f | 6d61 | 5f70 |
| 4405560 | 6f70 | 5f6e | 5f66 | 7265 | 6500 | 5f6d | 615f | 6765 | 745f | 6772 | 6f75 | 705f | 6d65 | 6d6f | 7279 | 5f75 | 7365 | 6400 | 5f77 | 696c | 645f | 7772 | 6974 | 655f |
| 4405640 | 6368 | 6563 | 6b00 | 5f6d | 615f | 7265 | 7472 | 795f | 616c | 6c6f | 6300 | 5f6d | 615f | 6d61 | 6b65 | 5f6e | 5f70 | 7573 | 6800 | 5f6c | 7369 | 736f | 7274 | 005f |

| | | | | | | | | | | | | | | | | | | | | | | | | |
|---|---|---|---|---|---|---|---|---|---|---|---|---|---|---|---|---|---|---|---|---|---|---|---|---|
| 4405720 | 7374 | 7269 | 6e67 | 736f | 7274 | 005f | 6961 | 7368 | 736f | 7274 | 005f | 696e | 6368 | 6173 | 6863 | 6f75 | 6e74 | 005f | 6275 | 636c | 6461 | 7272 | 6179 | 005f |
| 4406000 | 436f | 6d70 | 6f73 | 655f | 4d6f | 6447 | 656e | 5f44 | 6573 | 6372 | 6970 | 746f | 725f | 5f35 | 4164 | 6465 | 7246 | 5063 | 005f | 4c6f | 6164 | 5f56 | 4844 | 4c5f |
| 4406060 | 4461 | 7461 | 5f5f | 3541 | 6464 | 6572 | 4650 | 374e | 4f62 | 6a65 | 6374 | 005f | 7365 | 7449 | 6e64 | 6578 | 5f5f | 3541 | 6464 | 6572 | 4676 | 005f | 5f5f | 7074 |
| 4406140 | 626c | 5f5f | 3130 | 4465 | 7369 | 676e | 556e | 6974 | 5f5f | 4164 | 6465 | 725f | 6378 | 7800 | 5f5f | 5f70 | 7462 | 6c5f | 5f34 | 4c69 | 7374 | 5f5f | 4164 | 6465 |
| 4406220 | 725f | 6378 | 7800 | 5f5f | 5f70 | 7462 | 6c5f | 5f38 | 4c50 | 4f62 | 6a65 | 6374 | 5f5f | 4164 | 6465 | 725f | 6378 | 7800 | 5f5f | 5f76 | 7462 | 6c5f | 5f38 | 4c50 |
| 4406300 | 4f62 | 6a65 | 6374 | 5f5f | 4164 | 6465 | 725f | 6378 | 7800 | 5f5f | 5f70 | 7462 | 6c5f | 5f38 | 4765 | 6e56 | 616c | 7565 | 5f5f | 4164 | 6465 | 725f | 6378 | 7800 |
| 4406360 | 5f5f | 5f70 | 7462 | 6c5f | 5f38 | 4669 | 6c65 | 556e | 6974 | 5f5f | 4164 | 6465 | 725f | 6378 | 7800 | 5f5f | 5f76 | 7462 | 6c5f | 5f35 | 4164 | 6465 | 7200 | 5f5f |
| 4406440 | 5f70 | 7462 | 6c5f | 5f35 | 626c | 6f63 | 6b5f | 5f41 | 6464 | 6572 | 5f63 | 7878 | 005f | 5f5f | 7074 | 626c | 5f5f | 3541 | 6464 | 6572 | 5f5f | 4164 | 6465 | 725f |
| 4406520 | 6378 | 7800 | 5f5f | 5f70 | 7462 | 6c5f | 5f35 | 504c | 6973 | 745f | 5f41 | 6464 | 6572 | 5f63 | 7878 | 005f | 7365 | 745f | 5069 | 6e4c | 656e | 6774 | 685f | 5f36 |
| 4406600 | 4d6f | 6447 | 656e | 4650 | 6354 | 3100 | 5f5f | 5f70 | 7462 | 6c5f | 5f39 | 7061 | 7261 | 6d65 | 7465 | 725f | 5f41 | 6464 | 6572 | 5f63 | 7878 | 005f | 5f5f | 7074 |
| 4406660 | 626c | 5f5f | 3941 | 6c6c | 426c | 6f63 | 6b73 | 5f5f | 4164 | 6465 | 725f | 6378 | 7800 | 5f67 | 6574 | 5f6c | 6273 | 5f74 | 6563 | 684e | 756d | 5f5f | 3131 | 4d47 |
| 4406740 | 5f53 | 7065 | 6369 | 6669 | 6346 | 7600 | 5f65 | 7870 | 6c61 | 696e | 5f5f | 3644 | 6f64 | 4765 | 6e46 | 7600 | 5f74 | 656d | 704d | 4700 | 5f5f | 5f70 | 7462 | 6c5f |
| 4407020 | 5f36 | 4f62 | 6a65 | 6374 | 5f5f | 4164 | 6465 | 725f | 6378 | 7800 | 5f5f | 5f70 | 7462 | 6c5f | 5f36 | 4d6f | 6447 | 656e | 5f5f | 4164 | 6465 | 725f | 6378 | 7800 |
| 4407100 | 5f5f | 5f70 | 7462 | 6c5f | 5f36 | 656e | 7469 | 7479 | 5f5f | 4164 | 6465 | 725f | 6378 | 7800 | 5f5f | 5f70 | 7462 | 6c5f | 5f31 | 3662 | 6c6f | 636b | 5f61 | 7474 |
| 4407160 | 7269 | 6275 | 7465 | 735f | 5f41 | 6464 | 6572 | 5f63 | 7878 | 005f | 5f5f | 7674 | 626c | 5f5f | 3136 | 626c | 6f63 | 6b5f | 6174 | 7472 | 6962 | 7574 | 6573 | 5f5f |
| 4407240 | 4164 | 6465 | 725f | 6378 | 7800 | 5f5f | 5f76 | 7462 | 6c5f | 5f33 | 4d75 | 7800 | 5f5f | 5f70 | 7462 | 6c5f | 5f35 | 626c | 6f63 | 6b5f | 5f4d | 7578 | 5f63 | 7878 |
| 4407320 | 005f | 5f5f | 7074 | 626c | 5f5f | 3550 | 4c69 | 7374 | 5f5f | 4d75 | 785f | 6378 | 7800 | 5f5f | 5f70 | 7462 | 6c5f | 5f39 | 7061 | 7261 | 6d65 | 7465 | 725f | 5f4d |
| 4407400 | 7578 | 5f63 | 7878 | 005f | 5f5f | 7074 | 626c | 5f5f | 3941 | 6c6c | 426c | 6f63 | 6b73 | 5f5f | 4d75 | 785f | 6378 | 7800 | 5f5f | 5f70 | 7462 | 6c5f | 5f36 | 4f62 |
| 4407460 | 6a65 | 6374 | 5f5f | 4d75 | 785f | 6378 | 7800 | 5f5f | 5f70 | 7462 | 6c5f | 5f36 | 4d6f | 6447 | 656e | 5f5f | 4d75 | 785f | 6378 | 7800 | 5f5f | 5f70 | 7462 | 6c5f |
| 4407540 | 5f36 | 656e | 7469 | 7479 | 5f5f | 4d75 | 785f | 6378 | 7800 | 5f5f | 5f70 | 7462 | 6c5f | 5f31 | 3662 | 6c6f | 636b | 5f61 | 7474 | 7269 | 6275 | 7465 | 735f | 5f4d |
| 4407620 | 7578 | 5f63 | 7878 | 005f | 5f5f | 7674 | 626c | 5f5f | 3136 | 626c | 6f63 | 6b5f | 6174 | 7472 | 6962 | 7574 | 6573 | 5f5f | 4d75 | 785f | 6378 | 7800 | 5f43 | 6f6d |
| 4407700 | 706f | 7365 | 5f4d | 6f64 | 4765 | 6e5f | 4465 | 7363 | 7269 | 7074 | 6f72 | 5f5f | 334d | 7578 | 4650 | 6300 | 5f5f | 5f70 | 7462 | 6c5f | 5f33 | 4d75 | 785f | 5f4d |
| 4407760 | 7578 | 5f63 | 7878 | 005f | 4c6f | 6164 | 5f56 | 4844 | 4c5f | 4461 | 7461 | 5f5f | 334d | 7578 | 4650 | 374e | 4f62 | 6a65 | 6374 | 005f | 7365 | 7449 | 6e64 | 6578 |
| 4410040 | 5f5f | 334d | 7578 | 4676 | 005f | 5f5f | 7074 | 626c | 5f5f | 3130 | 4465 | 7369 | 676e | 556e | 6974 | 5f5f | 4d75 | 785f | 6378 | 7800 | 5f5f | 5f70 | 7462 | 6c5f |
| 4410120 | 5f34 | 4c69 | 7374 | 5f5f | 4d75 | 785f | 6378 | 7800 | 5f5f | 5f70 | 7462 | 6c5f | 5f38 | 4c50 | 4f62 | 6a65 | 6374 | 5f5f | 4d75 | 785f | 6378 | 7800 | 5f5f | 5f76 |
| 4410200 | 7462 | 6c5f | 5f38 | 4c50 | 4f62 | 6a65 | 6374 | 5f5f | 4d75 | 785f | 6378 | 7800 | 5f5f | 5f70 | 7462 | 6c5f | 5f38 | 4765 | 6e56 | 616c | 7565 | 5f5f | 4d75 | 785f |
| 4410260 | 6378 | 7800 | 5f5f | 5f70 | 7462 | 6c5f | 5f38 | 4669 | 6c65 | 556e | 6974 | 5f5f | 4d75 | 785f | 6378 | 7800 | 5f5f | 5f70 | 7462 | 6c5f | 5f38 | 4c50 | 4f62 | 6a65 |
| 4410340 | 6374 | 5f5f | 436f | 756e | 7465 | 725f | 6378 | 7800 | 5f5f | 5f76 | 7462 | 6c5f | 5f38 | 4c50 | 4f62 | 6a65 | 6374 | 5f5f | 436f | 756e | 7465 | 725f | 6378 | 7800 |
| 4410420 | 5f5f | 5f70 | 7462 | 6c5f | 5f38 | 4765 | 6e56 | 616c | 7565 | 5f5f | 436f | 756e | 7465 | 725f | 6378 | 7800 | 5f5f | 5f70 | 7462 | 6c5f | 5f38 | 4669 | 6c65 | 556e |
| 4410500 | 6974 | 5f5f | 436f | 756e | 7465 | 725f | 6378 | 7800 | 5f5f | 5f76 | 7462 | 6c5f | 5f37 | 436f | 756e | 7465 | 7200 | 5f5f | 5f70 | 7462 | 6c5f | 5f35 | 626c | 6f63 |
| 4410560 | 6b5f | 5f43 | 6f75 | 6e74 | 6572 | 5f63 | 7878 | 005f | 5f5f | 7074 | 626c | 5f5f | 3550 | 4c69 | 7374 | 5f5f | 436f | 756e | 7465 | 725f | 6378 | 7800 | 5f5f | 5f70 |
| 4410640 | 7462 | 6c5f | 5f39 | 7061 | 7261 | 6d65 | 7465 | 725f | 5f43 | 6f75 | 6e74 | 6572 | 5f63 | 7878 | 005f | 5f5f | 7074 | 626c | 5f5f | 3941 | 6c6c | 426c | 6f63 | 6b73 |
| 4410720 | 5f5f | 436f | 756e | 7465 | 725f | 6378 | 7800 | 5f5f | 5f70 | 7462 | 6c5f | 5f36 | 4f62 | 6a65 | 6374 | 5f5f | 436f | 756e | 7465 | 725f | 6378 | 7800 | 5f5f | 5f70 |
| 4411000 | 7462 | 6c5f | 5f36 | 4d6f | 6447 | 656e | 5f5f | 436f | 756e | 7465 | 725f | 6378 | 7800 | 5f5f | 5f70 | 7462 | 6c5f | 5f36 | 656e | 7469 | 7479 | 5f5f | 436f | 756e |
| 4411060 | 7465 | 725f | 6378 | 7800 | 5f5f | 5f70 | 7462 | 6c5f | 5f31 | 3662 | 6c6f | 636b | 5f61 | 7474 | 7269 | 6275 | 7465 | 735f | 5f43 | 6f75 | 6e74 | 6572 | 5f63 | 7878 |
| 4411140 | 005f | 5f5f | 7674 | 626c | 5f5f | 3136 | 626c | 6f63 | 6b5f | 6174 | 7472 | 6962 | 7574 | 6573 | 5f5f | 436f | 756e | 7465 | 725f | 6378 | 7800 | 5f43 | 6f6d | 706f |
| 4411220 | 7365 | 5f4d | 6f64 | 4765 | 6e5f | 4465 | 7363 | 7269 | 7074 | 6f72 | 5f5f | 3743 | 6f75 | 6e74 | 6572 | 4650 | 6300 | 5f4c | 6f61 | 645f | 5648 | 444c | 5f44 | 6174 |
| 4411300 | 615f | 5f37 | 436f | 756e | 7465 | 7246 | 5037 | 4e4f | 626a | 6563 | 7400 | 5f5f | 5f70 | 7462 | 6c5f | 5f37 | 436f | 756e | 7465 | 725f | 5f43 | 6f75 | 6e74 | 6572 |
| 4411360 | 5f63 | 7878 | 005f | 7365 | 7449 | 6e64 | 6578 | 5f5f | 3743 | 6f75 | 6e74 | 6572 | 4676 | 005f | 5f5f | 7074 | 626c | 5f5f | 3130 | 4465 | 7369 | 676e | 556e | 6974 |
| 4411440 | 5f5f | 436f | 756e | 7465 | 725f | 6378 | 7800 | 5f5f | 5f70 | 7462 | 6c5f | 5f34 | 4c69 | 7374 | 5f5f | 436f | 756e | 7465 | 725f | 6378 | 7800 | 5f5f | 5f70 | 7462 |
| 4411520 | 6c5f | 5f38 | 4c50 | 4f62 | 6a65 | 6374 | 5f5f | 4465 | 636f | 6465 | 725f | 6378 | 7800 | 5f5f | 5f76 | 7462 | 6c5f | 5f38 | 4c50 | 4f62 | 6a65 | 6374 | 5f5f | 4465 |
| 4411600 | 636f | 6465 | 725f | 6378 | 7800 | 5f5f | 5f70 | 7462 | 6c5f | 5f38 | 4765 | 6e56 | 616c | 7565 | 5f5f | 4465 | 636f | 6465 | 725f | 6378 | 7800 | 5f5f | 5f70 | 7462 |
| 4411660 | 6c5f | 5f38 | 4669 | 6c65 | 556e | 6974 | 5f5f | 4465 | 636f | 6465 | 725f | 6378 | 7800 | 5f5f | 5f76 | 7462 | 6c5f | 5f37 | 4465 | 636f | 6465 | 7200 | 5f5f | 5f70 |
| 4411740 | 7462 | 6c5f | 5f35 | 626c | 6f63 | 6b5f | 5f44 | 6563 | 6f64 | 6572 | 5f63 | 7878 | 005f | 5f5f | 7074 | 626c | 5f5f | 3550 | 4c69 | 7374 | 5f5f | 4465 | 636f | 6465 |
| 4412020 | 725f | 6378 | 7800 | 5f5f | 5f70 | 7462 | 6c5f | 5f39 | 7061 | 7261 | 6d65 | 7465 | 725f | 5f44 | 6563 | 6f64 | 6572 | 5f63 | 7878 | 005f | 5f5f | 7074 | 626c | 5f5f |
| 4412100 | 3941 | 6c6c | 426c | 6f63 | 6b73 | 5f5f | 4465 | 636f | 6465 | 725f | 6378 | 7800 | 5f5f | 5f70 | 7462 | 6c5f | 5f36 | 4f62 | 6a65 | 6374 | 5f5f | 4465 | 636f | 6465 |
| 4412160 | 725f | 6378 | 7800 | 5f5f | 5f70 | 7462 | 6c5f | 5f36 | 4d6f | 6447 | 656e | 5f5f | 4465 | 636f | 6465 | 725f | 6378 | 7800 | 5f5f | 5f70 | 7462 | 6c5f | 5f36 | 656e |
| 4412240 | 7469 | 7479 | 5f5f | 4465 | 636f | 6465 | 725f | 6378 | 7800 | 5f5f | 5f70 | 7462 | 6c5f | 5f31 | 3662 | 6c6f | 636b | 5f61 | 7474 | 7269 | 6275 | 7465 | 735f | 5f44 |
| 4412320 | 6563 | 6f64 | 6572 | 5f63 | 7878 | 005f | 5f5f | 7674 | 626c | 5f5f | 3136 | 626c | 6f63 | 6b5f | 6174 | 7472 | 6962 | 7574 | 6573 | 5f5f | 4465 | 636f | 6465 | 725f |
| 4412400 | 6378 | 7800 | 5f43 | 6f6d | 706f | 7365 | 5f4d | 6f64 | 4765 | 6e5f | 4465 | 7363 | 7269 | 7074 | 6f72 | 5f5f | 3744 | 6563 | 6f64 | 6572 | 4650 | 6300 | 5f4c | 6f61 |
| 4412460 | 645f | 5648 | 444c | 5f44 | 6174 | 615f | 5f37 | 4465 | 636f | 6465 | 7246 | 5037 | 4e4f | 626a | 6563 | 7400 | 5f5f | 5f70 | 7462 | 6c5f | 5f37 | 4465 | 636f | 6465 |
| 4412540 | 725f | 5f44 | 6563 | 6f64 | 6572 | 5f63 | 7878 | 005f | 7365 | 7449 | 6e64 | 6578 | 5f5f | 3744 | 6563 | 6f64 | 6572 | 4676 | 005f | 5f5f | 7074 | 626c | 5f5f | 3130 |
| 4412620 | 4465 | 7369 | 676e | 556e | 6974 | 5f5f | 4465 | 636f | 6465 | 725f | 6378 | 7800 | 5f5f | 5f70 | 7462 | 6c5f | 5f34 | 4c69 | 7374 | 5f5f | 4465 | 636f | 6465 | 725f |
| 4412700 | 6378 | 7800 | 5f5f | 5f70 | 7462 | 6c5f | 5f34 | 4c69 | 7374 | 5f5f | 4449 | 6372 | 656d | 656e | 746f | 725f | 6378 | 7800 | 5f4c | 6f61 | 645f | 5648 | 444c | 5f44 |
| 4412760 | 6174 | 615f | 5f31 | 3144 | 4963 | 7265 | 6d65 | 6e74 | 6f72 | 4650 | 374e | 4f62 | 6a65 | 6374 | 005f | 5f5f | 7074 | 626c | 5f5f | 384c | 504f | 626a | 6563 | 745f |

```
4413040  5f44 4963 7265 6d65 6e74 6f72 5f63 7878 005f 5f5f 7674 626c 5f5f 384c 504f 626a 6563 745f 5f44 4963 7265 6d65 6e74 6f72
4413120  5f63 7878 005f 5f5f 7074 626c 5f5f 3847 656e 5661 6c75 655f 5f44 4963 7265 6d65 6e74 6f72 5f63 7878 005f 5f5f 7074 626c
4413200  5f5f 3846 696c 6555 6e69 745f 5f44 4963 7265 6165 6e74 6f72 5f63 7878 005f 7365 7449 6e64 6578 5f5f 3131 4449 6372 656d
4413260  656e 746f 7246 7600 5f5f 5f70 7462 6c5f 5f31 3144 4963 7265 6d65 6e74 6f72 5f5f 4449 6372 656d 656e 746f 725f 6378 7800
4413340  5f5f 5f70 7462 6c5f 5f35 626c 6f63 6b5f 5f44 4963 7265 6d65 6e74 6f72 5f63 7878 005f 5f5f 7074 626c 5f5f 3550 4c69 7374
4413420  5f5f 4449 6372 656d 656e 746f 725f 6378 7800 5f5f 5f70 7462 6c5f 5f39 7061 7261 6d65 7465 725f 5f44 4963 7265 6d65 6e74
4413500  6f72 5f63 7878 005f 5f5f 7074 626c 5f5f 3941 6c6c 426c 6f63 6b73 5f5f 4449 6372 656d 656e 746f 725f 6378 7800 5f5f 5f76
4413560  7462 6c5f 5f31 3144 4963 7265 6d65 6e74 6f72 005f 5f5f 7074 626c 5f5f 364f 626a 6563 745f 5f44 4963 7265 6d65 6e74 6f72
4413640  5f63 7879 005f 5f5f 7074 626c 5f5f 364d 6f64 4765 6e5f 5f44 4963 7265 6d65 6e74 6f72 5f63 7878 005f 5f5f 7074 626c 5f5f
4413720  3665 6e74 6974 795f 5f44 4963 7265 6d65 6e74 6f72 5f63 7878 005f 5f5f 7074 626c 5f5f 3136 626c 6f63 6b5f 6174 7472 6962
4414000  7574 6573 5f5f 4449 6372 656d 656e 746f 725f 6378 7800 5f5f 5f76 7462 6c5f 5f31 3662 6c6f 636b 5f61 7474 7269 6275 7465
4414060  735f 5f44 4963 7265 6d65 6e74 6f72 5f63 7878 005f 436f 6d70 6f73 655f 4d6f 6447 656e 5f44 6573 6372 6970 746f 725f 5f31
4414140  3144 4963 7265 6d65 6e74 6f72 4650 6300 5f5f 5f70 7462 6c5f 5f31 3044 6573 6967 6e55 6e69 745f 5f44 4963 7265 6d65 6e74
4414220  6f72 5f63 7878 005f 5f5f 7074 626c 5f5f 3130 4465 7369 676e 556e 6974 5f5f 4669 666f 5f63 7878 005f 5f5f 7074 626c 5f5f
4414300  3446 6966 6f5f 5f46 6966 6f5f 6378 7800 5f5f 5f70 7462 6c5f 5f34 4c69 7374 5f5f 4669 666f 5f63 7878 005f 5f5f 7074 626c
4414360  5f5f 384c 504f 626a 6563 745f 5f46 6966 6f5f 6378 7800 5f5f 5f76 7462 6c5f 5f38 4c50 4f62 6a65 6374 5f5f 4669 666f 5f63
4414440  7878 005f 5f5f 7074 626c 5f5f 3847 656e 5661 6c75 655f 5f46 6966 6f5f 6378 7800 5f5f 5f70 7462 6c5f 5f38 4669 6c65 556e
4414520  6974 5f5f 4669 666f 5f63 7878 005f 5f5f 7674 626c 5f5f 3446 6966 6f00 5f5f 5f70 7462 6c5f 5f35 626c 6f63 6b5f 5f46 6966
4414600  6f5f 6378 7800 5f5f 5f70 7462 6c5f 5f35 504c 6973 745f 5f46 6966 6f5f 6378 7800 5f5f 5f70 7462 6c5f 5f39 7061 7261 6d65
4414660  7465 725f 5f46 6966 6f5f 6378 7800 5f5f 5f70 7462 6c5f 5f39 416c 6c42 6c6f 636b 735f 5f46 6966 6f5f 6378 7800 5f5f 5f70
4414740  7462 6c5f 5f36 4f62 6a65 6374 5f5f 4669 666f 5f63 7878 005f 5f5f 7074 626c 5f5f 364d 6f64 4765 6e5f 5f46 6966 6f5f 6378
4415020  7800 5f5f 5f70 7462 6c5f 5f36 656e 7469 7479 5f5f 4669 666f 5f63 7878 005f 5f5f 7074 626c 5f5f 3136 626c 6f63 6b5f 6174
4415100  7472 6962 7574 6573 5f5f 4669 666f 5f63 7878 005f 5f5f 7674 626c 5f5f 3136 626c 6f63 6b5f 6174 7472 6962 7574 6573 5f5f
4415160  4669 666f 5f63 7878 005f 436f 6d70 6f73 655f 4d6f 6447 656e 5f44 6573 6372 6970 746f 725f 5f34 4669 666f 4650 6300 5f4c
4415240  6f61 645f 5648 444c 5f44 6174 615f 5f34 4669 666f 4650 374e 4f62 6a65 6374 005f 7365 7449 6e64 6578 5f5f 3446 6966 6f46
4415320  7600 5f67 6574 5f4d 656d 5f74 6563 684e 756d 5f5f 3131 4d47 5f53 7065 6369 6669 6346 7600 5f5f 5f70 7462 6c5f 5f36 4d6f
4415400  6447 656e 5f5f 4d6f 6447 656e 5f63 7878 005f 5f5f 7074 626c 5f5f 364f 626a 6563 745f 5f4d 6f64 4765 6e5f 6378 7800 5f5f
4415460  5f70 7462 6c5f 5f34 4c69 7374 5f5f 4d6f 6447 656e 5f63 7878 005f 5f5f 7674 626c 5f5f 384c 504f 626a 6563 745f 5f4d 6f64
4415540  4765 6e5f 6378 7800 5f5f 5f70 7462 6c5f 5f38 4c50 4f62 6a65 6374 5f5f 4d6f 6447 656e 5f63 7878 005f 5f5f 7074 626c 5f5f
4415620  3550 4c69 7374 5f5f 4d6f 6447 656e 5f63 7878 005f 6765 745f 495f 5069 6e4c 656e 6774 685f 5f39 5069 6e4c 656e 6774 6846
4415700  6900 5f5f 5f70 7462 6c5f 5f35 4164 6465 725f 5f4d 475f 4d61 6e61 6765 725f 6378 7800 5f5f 5f70 7462 6c5f 5f35 504c 6973
4415760  745f 5f4d 475f 4161 6e61 6765 725f 6378 7800 5f5f 5f70 7462 6c5f 5f36 4f62 6a65 6374 5f5f 4d47 5f4d 616e 6167 6572 5f63
4416040  7878 005f 5f5f 7074 626c 5f5f 364d 6f64 4765 6e5f 5f4d 475f 4d61 6e61 6765 725f 6378 7800 5f5f 5f70 7462 6c5f 5f33 4d75
4416120  785f 5f4d 475f 4161 6e61 6765 725f 6378 7800 5f5f 5f70 7462 6c5f 5f37 436f 756e 7465 725f 5f4d 475f 4d61 6e61 6765 725f
4416200  6378 7800 5f5f 5f70 7462 6c5f 5f37 4465 636f 6465 725f 5f4d 475f 4d61 6e61 6765 725f 6378 7800 5f5f 5f70 7462 6c5f 5f34
4416260  4669 666f 5f5f 4147 5f4d 616e 6167 6572 5f63 7878 005f 5f5f 7074 626c 5f5f 344c 6973 745f 5f4d 475f 4d61 6e61 6765 725f
4416340  6378 7800 5f5f 5f70 7462 6c5f 5f38 4c50 4f62 6a65 6374 5f5f 4d47 5f4d 616e 6167 6572 5f63 7878 005f 5f5f 7674 626c 5f5f
4416420  384c 504f 626a 6563 745f 5f4d 475f 4d61 6e61 6765 725f 6378 7800 5f5f 5f70 7462 6c5f 5f31 3144 4963 7265 6d65 6e74 6f72
4416500  5f5f 4d47 5f4d 616e 6167 6572 5f63 7878 005f 6568 5f73 7461 636b 5f73 735f 6c6f 6700 5f65 685f 6765 745f 6578 6365 7074
4416560  596f 6e5f 666f 726d 6174 005f 616c 5f61 6c6c 6f63 005f 6568 5f69 735f 7374 6163 6b5f 656d 7074 7900 5f65 685f 706f 705f
4416640  6861 6e64 6c65 7200 5f65 685f 7261 6973 655f 6578 6365 7074 696f 6e00 5f65 685f 6465 6661 756c 745f 6861 6e64 6c65 7200
4416720  5f65 685f 6d61 6b65 5f65 7863 6570 7469 6f6e 005f 6d6c 5f66 7265 6500 5f6d 615f 696e 6974 6961 6c69 7a65 5f67 726f 7570
4417000  5f66 6f72 5f67 656e 6572 616c 5f66 7265 6500 5f6d 615f 6765 745f 6d65 6d6f 7279 5f75 7365 6400 5f6d 615f 6765 745f 6772
4417060  6f75 705f 6c61 6265 6c00 5f6d 615f 7365 745f 6772 6f75 705f 6c61 6265 6c00 5f6d 615f 636f 6d70 6172 655f 706f 696e 7465
4417140  7200 5f6d 615f 6973 5f67 726f 7570 005f 6d61 5f74 7572 6e5f 6f66 665f 6672 6565 5f63 6865 636b 005f 6d61 5f69 735f 706f
4417220  696e 7465 725f 696e 5f67 726f 7570 005f 6d61 5f73 7973 7465 6d5f 616c 6c6f 6300 5f6d 615f 7370 6563 6961 6c5f 666c 6167
4417300  005f 6d61 5f67 705f 6669 6c6c 5f66 6c61 6700 5f6d 615f 7475 726e 5f6f 6e5f 6669 6c6c 005f 6d61 5f76 6572 6966 795f 6772
4417360  6f75 7000 5f6d 615f 6861 7368 5f70 6f69 6e74 6572 005f 6d61 5f64 6566 6175 6c74 5f67 726f 7570 005f 6d61 5f67 6666 7265
4417440  6500 5f6d 615f 696e 6974 6961 6c69 7a65 5f67 726f 7570 5f66 6f72 5f6e 6f5f 6672 6565 005f 6d61 5f69 735f 706f 696e 7465
4417520  7200 5f6d 615f 7375 6d00 5f6d 615f 6765 745f 6e65 7874 5f67 726f 7570 005f 6d61 5f67 6676 6572 6966 795f 6772 6f75 7000
4417600  5f6d 615f 6766 616c 6c6f 6300 5f6d 615f 626c 6b66 696c 6c00 5f6d 615f 7475 726e 5f6f 6e5f 6672 6565 5f63 6865 636b 005f
4417660  6d61 5f74 7572 6e5f 6f6e 5f70 6164 005f 6d61 5f67 705f 7061 645f 666c 6167 005f 6d61 5f63 6f75 6e74 5f67 726f 7570 005f
4417740  6d61 5f6e 6666 7265 6500 5f6d 615f 6e66 7665 7269 6679 5f67 726f 7570 005f 6d61 5f6e 6661 6c6c 6f63 005f 6874 5f69 735f
4420020  7461 626c 6500 5f68 745f 7665 7269 6679 5f74 6162 6c65 005f 7374 5f68 6173 685f 7374 7269 6e67 005f 6874 5f67 6574 5f63
4420100  6f75 6e74 005f 7374 5f69 6e73 6572 745f 7374 7269 6e67 5f74 6162 6c65 005f 6874 5f6d 616b 655f 7374 7269 6e67 5f74 6162
```

```
4420160  6c65 005f 6874 5f66 7265 655f 7461 626c 6500 5f68 745f 7265 706c 6163 655f 656c 656d 656e 7400 5f73 745f 636f 6e76 6572
4420240  745f 6368 6172 5f74 6f5f 6e75 6d62 6572 005f 7374 5f69 735f 616c 7068 616e 756d 6572 6963 005f 7374 5f69 735f 616c 7068
4420320  6100 5f73 745f 6973 5f73 7061 6365 005f 7374 5f69 735f 7570 7065 7200 5f73 745f 6973 5f6c 6f77 6572 005f 7374 5f69 735f
4420400  6469 6769 7400 5f73 745f 636f 6370 6172 655f 6e61 6d65 005f 7374 5f75 7070 6572 6361 7365 5f73 7472 696e 6700 5f73 745f
4420460  6c6f 7765 7263 6173 655f 7374 7269 6e67 005f 7374 5f63 6f6e 6361 745f 7374 7269 6e67 005f 7374 5f63 6f6d 7061 7265 5f6e
4420540  6f63 6173 655f 7374 7269 6e67 005f 7374 5f63 6f6d 7061 7265 5f73 7472 696e 6700 5f73 745f 7570 7065 7263 6173 655f 6368
4420620  6172 005f 7374 5f6c 6f77 6572 6361 7365 5f63 6861 7200 0000 0000 0000 0000 0000 0000 0000 0000 0000 0000 0000 0000 0000
4420700  0000 0000 0000 0000 0000 0000 0000 0000 0000 0000 0000 0000 0000 0000 0000 0000 0000 0000 0000 0000 0000 0000 0000 0000
*
4440000
```

```
FILE: LIVS      HEX      A1  ***LSI  LOGIC  CORP,  MILPITAS

0000000   65786563 202f686f 6d652f6f 73617332 2f622f71 75696e74 75732f62 696e322e 352f7375 6e342d34 2e302f70 726f6c6f
0000060   67202b53 20243020 242a0a23 0a232051 75696e74 75732050 726f6c6f 67207361 76656420 73746174 65202875 6e707269
0000140   6e746162 6c652129 0a0a0c0a 0a000000 0009630c f7ffef50 00014470 0001979c 7ffffffc 000972ab 000972a8 00097d7b
0000220   00097d7c f779a954 00008001 f815affc 00097c70 000962f8 0000008a 00000000 fffffefb4 00000006 f77e205c 000962f8
0000300   00080ddc 00002800 00097c70 00000001 00000080 f7ffefb0 00013b04 00002800 00000000 ffff2f3 ffffffff 00101083
0000360   000f1de6 00097d7b fffffff9c 00801082 0010746f 000009ce 00000001 00000001 00000000 0006efd8 000958e0 00024388
0000440   00066dd8 e6f65f53 122e3500 00000000 00000000 00000000 00093a19 0009a000 55555555 0009a000 0009a000 0009a000
0000520   000f4dd4 000f65f0 000f6e04 000f826c 000f926c 000f9e68 000f9e70 000fa394 000fbafc 000fc000 55555555 00000000
0000600   00000000 00000000 00000000 00000000 00000000 00000000 00000000 00000000 00000000 00000000 00000000 00000000
*
0003000   0000002c 0006f464 b4f0b4e4 00000000 7fffffff 00080c4d 000000fc 0000002f 0006f490 0002438a 00093b88 00000030
0003060   000c52b8 b27cb66c 00000000 7fffffff 0006f4c0 02000ce5 03002c3d 00000ce7 00002583 00002d2f 00002aff 00000030
0003140   0006f490 b27cb66c 00000000 7fffffff 0006f4f0 02000ce5 03002c3d 00000a5f 00002583 00002d2f 00002aff 00000030
0003220   0006f4c0 b27cb66c 00000000 7fffffff 0006f520 02000ce5 03002c3d 00000ce7 00002583 0000203f 00002aff 00000030
0003300   0006f4f0 b27cb66c 00000000 7fffffff 0006f550 02000ce5 03002c3d 00000d77 00002583 0000203f 00002aff 00000030
0003360   0006f520 b27cb66c 00000000 7fffffff 0006f580 02000ce5 03002c3d 00002477 000023f3 0000203f 00002aff 00000030
0003440   0006f550 b27cb66c 00000000 7fffffff 0006f5b0 02000ce5 03002c3d 00002757 000023f3 0000203f 00002aff 00000030
0003520   0006f580 b27cb66c 00000000 7fffffff 0006f5e0 02000ce5 03002c3d 00001e6f 000023f3 0000203f 00002aff 00000030
0003600   0006f5b0 b27cb66c 00000000 7fffffff 0006f610 02000ce5 03002c3d 000024e7 000023f3 0000203f 00002aff 00000030
0003660   0006f5e0 b27cb66c 00000000 7fffffff 0006f640 02000ce5 03002c3d 0000242f 000023f3 0000203f 00002aff 00000030
0003740   0006f610 b27cb66c 00000000 7fffffff 0006f670 02000ce5 03002c3d 00000d0f 00002263 00002d37 00002aff 00000030
0004020   0006f640 b27cb66c 00000000 7fffffff 0006f6a0 02000ce5 03002c3d 00000a67 000020d3 00002d37 00002aff 00000030
0004100   0006f670 b27cb66c 00000000 7fffffff 0006f6d0 02000ce5 03002c3d 00000a3f 00001f43 00002d37 00002aff 00000030
0004160   0006f6a0 b27cb66c 00000000 7fffffff 0006f700 02000ce5 03002c3d 00001647 00001c23 00002047 00002aff 00000030
0004240   0006f6d0 b27cb66c 00000000 7fffffff 0006f730 02000ce5 03002c3d 00002957 00001c23 00002047 00002aff 00000030
0004320   0006f700 b27cb66c 00000000 7fffffff 0006f760 02000ce5 03002c3d 000025b7 00001c23 00002047 00002aff 00000030
0004400   0006f730 b27cb66c 00000000 7fffffff 0006f790 02000ce5 03002c3d 00000d27 000015e3 00002d2f 00002aff 00000030
0004460   0006f760 b27cb66c 00000000 7fffffff 0006f7c0 02000ce5 03002c3d 0000226f 000015e3 00002d2f 00002aff 00000030
0004540   0006f790 b27cb66c 00000000 7fffffff 0006f7f0 02000ce5 03002c3d 00000d2f 000015e3 00002d2f 00002aff 00000030
0004620   0006f7c0 b27cb66c 00000000 7fffffff 0006f820 02000ce5 03002c3d 00000d47 000015e3 00002d2f 00002aff 00000030
0004700   0006f7f0 b27cb66c 00000000 7fffffff 0006f850 02000ce5 03002c3d 00001657 000015e3 00002d2f 00002aff 00000030
0004760   0006f820 b27cb66c 00000000 7fffffff 0006f880 02000ce5 03002c3d 00000d7f 000015e3 00002d2f 00002aff 00000030
0005040   0006f850 b27cb66c 00000000 7fffffff 0006f8b0 02000ce5 03002c3d 00000d8f 000015e3 00002d2f 00002aff 00000030
0005120   0006f880 b27cb66c 00000000 7fffffff 0006f8e0 02000ce5 03002c3d 00000d87 000015e3 00002d2f 00002aff 00000030
0005200   0006f8b0 b27cb66c 00000000 7fffffff 0006f910 02000ce5 03002c3d 00000d97 000015e3 00002d2f 00002aff 00000030
0005260   0006f8e0 b27cb66c 00000000 7fffffff 0006f940 02000ce5 03002c3d 00000d37 000015e3 00002d2f 00002aff 00000030
0005340   0006f910 b27cb66c 00000000 7fffffff 0006f970 02000ce5 03002c3d 00000d4f 000015e3 00002d2f 00002aff 00000030
0005420   0006f940 b27cb66c 00000000 7fffffff 0006f9a0 02000ce5 03002c3d 00000d17 000015e3 00002d2f 00002aff 00000030
0005500   0006f970 b27cb66c 00000000 7fffffff 0006f9d0 02000ce5 03002c3d 00000d57 000015e3 0000212f 00002aff 00000030
0005560   0006f9a0 b27cb66c 00000000 7fffffff 0006fa00 02000ce5 03002c3d 00000d3f 000015e3 00002d2f 00002aff 00000030
0005640   0006f9d0 b27cb66c 00000000 7fffffff 0006fa30 02000ce5 03002c3d 00000d5f 000015e3 00002d2f 00002aff 00000030
0005720   0006fa00 b27cb66c 00000000 7fffffff 0006fa60 02000ce5 03002c3d 00000cdf 000012c3 00002d37 00002aff 00000030
0006000   0006fa30 b27cb66c 00000000 7fffffff 0006fa90 02000ce5 03002c3d 00000a37 00000fa3 00002d4f 00002aff 00000030
0006060   0006fa60 b27cb66c 00000000 7fffffff 0006fac0 02000ce5 03002c3d 00000a57 00000fa3 00002d4f 00002aff 00000030
0006140   0006fa90 b27cb66c 00000000 7fffffff 0006faf0 02000ce5 03002c3d 0000164f 00000fa3 00002d4f 00002aff 00000030
0006220   0006fac0 b27cb66c 00000000 7fffffff 0006fb20 02000ce5 03002c3d 00000adf 00000fa3 00002d4f 00002aff 00000030
0006300   0006faf0 b27cb66c 00000000 7fffffff 0006fb50 02000ce5 03002c3d 00000a37 00000fa3 0000203f 00002aff 00000030
0006360   0006fb20 b27cb66c 00000000 7fffffff 0006fb80 02000ce5 03002c3d 00000a57 00000fa3 0000203f 00002aff 00000030
0006440   0006fb50 b27cb66c 00000000 7fffffff 0006fbb0 02000ce5 03002c3d 00000abf 00000c83 00002d4f 00002aff 00000030
0006520   0006fb80 b27cb66c 00000000 7fffffff 0006fbe0 02000ce5 03002c3d 00000ad7 00000c83 00002d4f 00002aff 00000030
0006600   0006fbb0 b27cb66c 00000000 7fffffff 0006fc10 02000ce5 03002c3d 00000a07 00000c83 00002d4f 00002aff 00000030
0006660   0006fbe0 b27cb66c 00000000 7fffffff 0006fc40 02000ce5 03002c3d 00000d1f 00000c83 00002d4f 00002aff 00000030
0006740   0006fc10 b27cb66c 00000000 7fffffff 0006fc70 02000ce5 03002c3d 00000d67 00000c83 00002d4f 00002aff 00000030
0007020   0006fc40 b27cb66c 00000000 7fffffff 0006fca0 02000ce5 03002c3d 0000246f 00000963 00002d2f 00002aff 00000030
0007100   0006fc70 b27cb66c 00000000 7fffffff 0009ef80 02000ce5 03002c3d 0000166f 00000643 00002d37 00002aff 00000000
```

```
0007160  00000000 00000000 00000000 00000000 00000000 00000000 00000000 00000000 00000000 00000000 00000000 00000000
*
0014000  0000002c 00070664 b4f0b4e4 00000000 7fffffff 0007f6ad 0000001c 00000006 00070690 0002438a 000943c0 00000034
0014060  00070794 b27cb66c 00000000 7fffffff 000706c4 02000ce5 0400217d 00002307 0000000b 0000001f 00002c07 00002aff
0014140  00000034 00070690 b27cb66c 00000000 7fffffff 000706f8 02000ce5 0400217d 00001f77 00000013 0000001f 00002c07
0014220  00002aff 00000034 000706c4 b27cb66c 00000000 7fffffff 0007072c 02000ce5 0400217d 000026cf 0000000b 0000001f
0014300  00002c07 00002aff 00000034 000706f8 b27cb66c 00000000 7fffffff 00070760 02000ce5 0400217d 00002a5f 00000013
0014360  0000001f 00002c07 00002aff 00000034 0007072c b27cb66c 00000000 7fffffff 00070794 02000ce5 0400217d 00002c1f
0014440  00000003 0000001f 00002c07 00002aff 00000034 00070760 b27cb66c 00000000 7fffffff 00070665 02000ce5 0400217d
0014520  00002c17 00000023 0000001f 00002c07 00002aff 0000002c 000707c8 b4f0b4e4 00000000 7fffffff 0007f60d 000003fc
0014600  000000e3 000707f4 0002438a 00094450 00000034 000bb8e0 b27cb66c 00000000 7fffffff 00070828 02000ce5 04002105
0014660  00002307 0000000b 00002c07 00001ef7 00002aff 00000034 000707f4 b27cb66c 00000000 7fffffff 0007085c 02000ce5
0014740  04002105 00001f77 00000013 00002c07 00001ef7 00002aff 00000034 00070828 b27cb66c 00000000 7fffffff 00070890
0015020  02000ce5 04002105 000026cf 0000000b 00002c07 00001ef7 00002aff 00000034 0007085c b27cb66c 00000000 7fffffff
0015100  000708c4 02000ce5 04002105 00002a5f 00000013 00002c07 00001ef7 00002aff 00000034 00070890 b27cb66c 00000000
0015160  7fffffff 000708f8 02000ce5 04002105 00002c1f 00000003 00002c07 00001ef7 00002aff 00000034 000708c4 b27cb66c
0015240  00000000 7fffffff 0007092c 02000ce5 04002105 00002c17 00000023 00002c07 00001ef7 00002aff 00000034 000708f8
0015320  b27cb66c 00000000 7fffffff 00070960 02000ce5 04002105 00000fe7 00000003 0000001f 00001c3f 00002aff 00000034
0015400  0007092c b27cb66c 00000000 7fffffff 00070994 02000ce5 04002105 00001007 00000003 0000001f 00001c3f 00002aff
0015460  00000034 00070960 b27cb66c 00000000 7fffffff 000709c8 02000ce5 04002105 00001aaf 0000000b 0000001f 00001c3f
0015540  00002aff 00000034 00070994 b27cb66c 00000000 7fffffff 000709fc 02000ce5 04002105 00001aaf 00000013 0000001f
0015620  00001c3f 00002aff 00000034 000709c8 b27cb66c 00000000 7fffffff 00070a30 02000ce5 04002105 00001ab7 00000003
0015700  0000001f 00001c3f 00002aff 00000034 000709fc b27cb66c 00000000 7fffffff 00070a64 02000ce5 04002105 00001acf
0015760  00000013 0000001f 00001c3f 00002aff 00000034 00070a30 b27cb66c 00000000 7fffffff 00070a98 02000ce5 04002105
0016040  00001b17 0000000b 00000027 00001c3f 00002aff 00000034 00070a64 b27cb66c 00000000 7fffffff 00070acc 02000ce5
0016120  04002105 00001b5f 0000001b 0000001f 00001c3f 00002aff 00000034 00070a98 b27cb66c 00000000 7fffffff 00070b00
0016200  02000ce5 04002105 00001b77 0000000b 0000001f 00001c3f 00002aff 00000034 00070acc b27cb66c 00000000 7fffffff
0016260  00070b34 02000ce5 04002105 00001b77 00000013 0000001f 00001c3f 00002aff 00000034 00070b00 b27cb66c 00000000
0016340  7fffffff 00070b68 02000ce5 04002105 00001b7f 0000000b 0000001f 00001c3f 00002aff 00000034 00070b34 b27cb66c
0016420  00000000 7fffffff 00070b9c 02000ce5 04002105 00001b7f 00000013 0000001f 00001c3f 00002aff 00000034 00070b68
0016500  b27cb66c 00000000 7fffffff 00070bd0 02000ce5 04002105 00001b87 0000000b 0000001f 00001c3f 00002aff 00000034
0016560  00070b9c b27cb66c 00000000 7fffffff 00070c04 02000ce5 04002105 00001b87 00000013 0000001f 00001c3f 00002aff
0016640  00000034 00070bd0 b27cb66c 00000000 7fffffff 00070c38 02000ce5 04002105 00001b97 0000000b 0000001f 00001c3f
0016720  00002aff 00000034 00070c04 b27cb66c 00000000 7fffffff 00070c6c 02000ce5 04002105 00001baf 0000000b 0000001f
0017000  00001c3f 00002aff 00000034 00070c38 b27cb66c 00000000 7fffffff 00070ca0 02000ce5 04002105 00001ba7 00000013
0017060  0000001f 00001c3f 00002aff 00000034 00070c6c b27cb66c 00000000 7fffffff 00070cd4 02000ce5 04002105 00001bef
0017140  0000001b 0000001f 00001c3f 00002aff 00000034 00070ca0 b27cb66c 00000000 7fffffff 00070d08 02000ce5 04002105
0017220  00001c1f 00000003 0000001f 00001c3f 00002aff 00000034 00070cd4 b27cb66c 00000000 7fffffff 00070d3c 02000ce5
0017300  04002105 00000da7 0000001b 0000001f 00001c3f 00002aff 00000034 00070d08 b27cb66c 00000000 7fffffff 00070d70
0017360  02000ce5 04002105 00001c67 0000000b 00000027 00001c3f 00002aff 00000034 00070d3c b27cb66c 00000000 7fffffff
0017440  00070da4 02000ce5 04002105 00001cff 00000013 0000001f 00001c3f 00002aff 00000034 00070d70 b27cb66c 00000000
0017520  7fffffff 00070dd8 02000ce5 04002105 00001d1f 00000013 0000001f 00001c3f 00002aff 00000034 00070da4 b27cb66c
0017600  00000000 7fffffff 00070e0c 02000ce5 04002105 00001d1f 0000001b 0000001f 00001c3f 00002aff 00000034 00070dd8
0017660  b27cb66c 00000000 7fffffff 00070e40 02000ce5 04002105 00001d37 0000000b 0000001f 00001c3f 00002aff 00000034
0017740  00070e0c b27cb66c 00000000 7fffffff 00070e74 02000ce5 04002105 00001d47 0000001b 0000001f 00001c3f 00002aff
0020020  00000034 00070e40 b27cb66c 00000000 7fffffff 00070ea8 02000ce5 04002105 00001d57 0000000b 0000001f 00001c3f
0020100  00002aff 00000034 00070e74 b27cb66c 00000000 7fffffff 00070edc 02000ce5 04002105 00001d7f 0000000b 0000001f
0020160  00001c3f 00002aff 00000034 00070ea8 b27cb66c 00000000 7fffffff 00070f10 02000ce5 04002105 00001d8f 00000013
0020240  0000001f 00001c3f 00002aff 00000034 00070edc b27cb66c 00000000 7fffffff 00070f44 02000ce5 04002105 00001da7
0020320  0000000b 0000001f 00001c3f 00002aff 00000034 00070f10 b27cb66c 00000000 7fffffff 00070f78 02000ce5 04002105
0020400  00001db7 00000013 0000001f 00001c3f 00002aff 00000034 00070f44 b27cb66c 00000000 7fffffff 00070fac 02000ce5
0020460  04002105 00001dbf 0000000b 0000001f 00001c3f 00002aff 00000034 00070f78 b27cb66c 00000000 7fffffff 00070fe0
0020540  02000ce5 04002105 00001dc7 00000013 0000001f 00001c3f 00002aff 00000034 00070fac b27cb66c 00000000 7fffffff
0020620  00071014 02000ce5 04002105 00001dcf 0000000b 0000001f 00001c3f 00002aff 00000034 00070fe0 b27cb66c 00000000
0020700  7fffffff 00071048 02000ce5 04002105 00001dcf 00000013 0000001f 00001c3f 00002aff 00000034 00071014 b27cb66c
```

| | | | | | | | | | | | | |
|---|---|---|---|---|---|---|---|---|---|---|---|---|
| 0020760 | 00000000 | 7fffffff | 0007107c | 02000ce5 | 04002105 | 00001dd7 | 0000001b | 0000001f | 00001c3f | 00002aff | 00000034 | 00071048 |
| 0021040 | b27cb66c | 00000000 | 7fffffff | 000710b0 | 02000ce5 | 04002105 | 00001ddf | 0000000b | 0000001f | 00001c3f | 00002aff | 00000034 |
| 0021120 | 0007107c | b27cb66c | 00000000 | 7fffffff | 000710e4 | 02000ce5 | 04002105 | 00001de7 | 00000013 | 0000001f | 00001c3f | 00002aff |
| 0021200 | 00000034 | 000710b0 | b27cb66c | 00000000 | 7fffffff | 00071118 | 02000ce5 | 04002105 | 00001def | 0000001b | 0000001f | 00001c3f |
| 0021260 | 00002aff | 00000034 | 000710e4 | b27cb66c | 00000000 | 7fffffff | 0007114c | 02000ce5 | 04002105 | 00001e07 | 00000003 | 00000027 |
| 0021340 | 00001c3f | 00002aff | 00000034 | 00071118 | b27cb66c | 00000000 | 7fffffff | 00071180 | 02000ce5 | 04002105 | 00001e0f | 00000003 |
| 0021420 | 00000027 | 00001c3f | 00002aff | 00000034 | 0007114c | b27cb66c | 00000000 | 7fffffff | 000711b4 | 02000ce5 | 04002105 | 00001e1f |
| 0021500 | 0000000b | 00000027 | 00001c3f | 00002aff | 00000034 | 00071180 | b27cb66c | 00000000 | 7fffffff | 000711e8 | 02000ce5 | 04002105 |
| 0021560 | 00001e4f | 0000000b | 0000001f | 00001c3f | 00002aff | 00000034 | 000711b4 | b27cb66c | 00000000 | 7fffffff | 0007121c | 02000ce5 |
| 0021640 | 04002105 | 00001e6f | 0000000b | 0000001f | 00001c3f | 00002aff | 00000034 | 000711e8 | b27cb66c | 00000000 | 7fffffff | 00071250 |
| 0021720 | 02000ce5 | 04002105 | 00001ebf | 0000000b | 0000001f | 00001c3f | 00002aff | 00000034 | 0007121c | b27cb66c | 00000000 | 7fffffff |
| 0022000 | 00071284 | 02000ce5 | 04002105 | 00001ec7 | 0000000b | 0000001f | 00001c3f | 00002aff | 00000034 | 00071250 | b27cb66c | 00000000 |
| 0022060 | 7fffffff | 000712b8 | 02000ce5 | 04002105 | 00001eef | 00000013 | 0000001f | 00001c3f | 00002aff | 00000034 | 00071284 | b27cb66c |
| 0022140 | 00000000 | 7fffffff | 000712ec | 02000ce5 | 04002105 | 00001f17 | 00000003 | 0000001f | 00001c3f | 00002aff | 00000034 | 000712b8 |
| 0022220 | b27cb66c | 00000000 | 7fffffff | 00071320 | 02000ce5 | 04002105 | 00001f4f | 00000003 | 0000001f | 00001c3f | 00002aff | 00000034 |
| 0022300 | 000712ec | b27cb66c | 00000000 | 7fffffff | 00071354 | 02000ce5 | 04002105 | 00001f7f | 00000003 | 0000001f | 00001c3f | 00002aff |
| 0022360 | 00000034 | 00071320 | b27cb66c | 00000000 | 7fffffff | 00071388 | 02000ce5 | 04002105 | 00001fa7 | 0000001b | 0000001f | 00001c3f |
| 0022440 | 00002aff | 00000034 | 00071354 | b27cb66c | 00000000 | 7fffffff | 000713bc | 02000ce5 | 04002105 | 00001fbf | 0000000b | 0000001f |
| 0022520 | 00001c3f | 00002aff | 00000034 | 00071388 | b27cb66c | 00000000 | 7fffffff | 000713f0 | 02000ce5 | 04002105 | 00001fcf | 0000000b |
| 0022600 | 0000001f | 00001c3f | 00002aff | 00000034 | 000713bc | b27cb66c | 00000000 | 7fffffff | 00071424 | 02000ce5 | 04002105 | 00002017 |
| 0022660 | 00000013 | 00000037 | 00001c3f | 00002aff | 00000034 | 000713f0 | b27cb66c | 00000000 | 7fffffff | 00071458 | 02000ce5 | 04002105 |
| 0022740 | 00002017 | 0000001b | 00000037 | 00001c3f | 00002aff | 00000034 | 00071424 | b27cb66c | 00000000 | 7fffffff | 0007148c | 02000ce5 |
| 0023020 | 04002105 | 00002037 | 0000001b | 0000001f | 00001c3f | 00002aff | 00000034 | 00071458 | b27cb66c | 00000000 | 7fffffff | 000714c0 |
| 0023100 | 02000ce5 | 04002105 | 0000205f | 00000003 | 0000001f | 00001c3f | 00002aff | 00000034 | 0007148c | b27cb66c | 00000000 | 7fffffff |
| 0023160 | 000714f4 | 02000ce5 | 04002105 | 0000206f | 00000003 | 0000001f | 00001c3f | 00002aff | 00000034 | 000714c0 | b27cb66c | 00000000 |
| 0023240 | 7fffffff | 00071528 | 02000ce5 | 04002105 | 0000209f | 0000001b | 0000001f | 00001c3f | 00002aff | 00000034 | 000714f4 | b27cb66c |
| 0023320 | 00000000 | 7fffffff | 0007155c | 02000ce5 | 04002105 | 000020bf | 0000000b | 0000001f | 00001c3f | 00002aff | 00000034 | 00071528 |
| 0023400 | b27cb66c | 00000000 | 7fffffff | 00071590 | 02000ce5 | 04002105 | 000020bf | 00000013 | 0000001f | 00001c3f | 00002aff | 00000034 |
| 0023460 | 0007155c | b27cb66c | 00000000 | 7fffffff | 000715c4 | 02000ce5 | 04002105 | 000020c7 | 0000000b | 0000001f | 00001c3f | 00002aff |
| 0023540 | 00000034 | 00071590 | b27cb66c | 00000000 | 7fffffff | 000715f8 | 02000ce5 | 04002105 | 000020c7 | 00000013 | 0000001f | 00001c3f |
| 0023620 | 00002aff | 00000034 | 000715c4 | b27cb66c | 00000000 | 7fffffff | 0007162c | 02000ce5 | 04002105 | 000020ff | 00000003 | 0000001f |
| 0023700 | 00001c3f | 00002aff | 00000034 | 000715f8 | b27cb66c | 00000000 | 7fffffff | 00071660 | 02000ce5 | 04002105 | 0000211f | 00000003 |
| 0023760 | 0000001f | 00001c3f | 00002aff | 00000034 | 0007162c | b27cb66c | 00000000 | 7fffffff | 00071694 | 02000ce5 | 04002105 | 0000211f |
| 0024040 | 0000000b | 0000001f | 00001c3f | 00002aff | 00000034 | 00071660 | b27cb66c | 00000000 | 7fffffff | 000716c8 | 02000ce5 | 04002105 |
| 0024120 | 000021af | 0000000b | 00000027 | 00001c3f | 00002aff | 00000034 | 00071694 | b27cb66c | 00000000 | 7fffffff | 000716fc | 02000ce5 |
| 0024200 | 04002105 | 000021df | 00000013 | 0000001f | 00001c3f | 00002aff | 00000034 | 000716c8 | b27cb66c | 00000000 | 7fffffff | 00071730 |
| 0024260 | 02000ce5 | 04002105 | 000021ef | 0000000b | 0000001f | 00001c3f | 00002aff | 00000034 | 000716fc | b27cb66c | 00000000 | 7fffffff |
| 0024340 | 00071764 | 02000ce5 | 04002105 | 0000226f | 00000013 | 0000001f | 00001c3f | 00002aff | 00000034 | 00071730 | b27cb66c | 00000000 |
| 0024420 | 7fffffff | 00071798 | 02000ce5 | 04002105 | 000022af | 00000013 | 0000001f | 00001c3f | 00002aff | 00000034 | 00071764 | b27cb66c |
| 0024500 | 00000000 | 7fffffff | 000717cc | 02000ce5 | 04002105 | 000022c7 | 0000000b | 00000027 | 00001c3f | 00002aff | 00000034 | 00071798 |
| 0024560 | b27cb66c | 00000000 | 7fffffff | 00071800 | 02000ce5 | 04002105 | 000022df | 00000013 | 0000001f | 00001c3f | 00002aff | 00000034 |
| 0024640 | 000717cc | b27cb66c | 00000000 | 7fffffff | 00071834 | 02000ce5 | 04002105 | 0000230f | 00000013 | 0000001f | 00001c3f | 00002aff |
| 0024720 | 00000034 | 00071800 | b27cb66c | 00000000 | 7fffffff | 00071868 | 02000ce5 | 04002105 | 00002317 | 00000013 | 0000001f | 00001c3f |
| 0025000 | 00002aff | 00000034 | 00071834 | b27cb66c | 00000000 | 7fffffff | 0007189c | 02000ce5 | 04002105 | 00002337 | 00000003 | 0000001f |
| 0025060 | 00001c3f | 00002aff | 00000034 | 00071868 | b27cb66c | 00000000 | 7fffffff | 000718d0 | 02000ce5 | 04002105 | 00002337 | 0000000b |
| 0025140 | 0000001f | 00001c3f | 00002aff | 00000034 | 0007189c | b27cb66c | 00000000 | 7fffffff | 00071904 | 02000ce5 | 04002105 | 00002357 |
| 0025220 | 00000013 | 0000002f | 00001c3f | 00002aff | 00000034 | 000718d0 | b27cb66c | 00000000 | 7fffffff | 00071938 | 02000ce5 | 04002105 |
| 0025300 | 00002357 | 0000001b | 0000002f | 00001c3f | 00002aff | 00000034 | 00071904 | b27cb66c | 00000000 | 7fffffff | 0007196c | 02000ce5 |
| 0025360 | 04002105 | 0000239f | 00000003 | 0000001f | 00001c3f | 00002aff | 00000034 | 00071938 | b27cb66c | 00000000 | 7fffffff | 000719a0 |
| 0025440 | 02000ce5 | 04002105 | 000023d7 | 00000003 | 0000001f | 00001c3f | 00002aff | 00000034 | 0007196c | b27cb66c | 00000000 | 7fffffff |
| 0025520 | 000719d4 | 02000ce5 | 04002105 | 000023d7 | 0000000b | 0000001f | 00001c3f | 00002aff | 00000034 | 000719a0 | b27cb66c | 00000000 |
| 0025600 | 7fffffff | 00071a08 | 02000ce5 | 04002105 | 00002407 | 0000000b | 00000027 | 00001c3f | 00002aff | 00000034 | 000719d4 | b27cb66c |
| 0025660 | 00000000 | 7fffffff | 00071a3c | 02000ce5 | 04002105 | 0000242f | 0000000b | 0000001f | 00001c3f | 00002aff | 00000034 | 00071a08 |
| 0025740 | b27cb66c | 00000000 | 7fffffff | 00071a70 | 02000ce5 | 04002105 | 00002477 | 0000000b | 0000001f | 00001c3f | 00002aff | 00000034 |
| 0026020 | 00071a3c | b27cb66c | 00000000 | 7fffffff | 00071aa4 | 02000ce5 | 04002105 | 00002487 | 0000000b | 0000001f | 00001c3f | 00002aff |

| | | | | | | | | | | | | |
|---|---|---|---|---|---|---|---|---|---|---|---|---|
| 0026100 | 00000034 | 00071a70 | b27cb66c | 00000000 | 7fffffff | 00071ad8 | 02000ce5 | 04002105 | 00002487 | 00000013 | 0000001f | 00001c3f |
| 0026160 | 00002aff | 00000034 | 00071aa4 | b27cb66c | 00000000 | 7fffffff | 00071b0c | 02000ce5 | 04002105 | 000024e7 | 0000000b | 0000001f |
| 0026240 | 00001c3f | 00002aff | 00000034 | 00071ad8 | b27cb66c | 00000000 | 7fffffff | 00071b40 | 02000ce5 | 04002105 | 000024ef | 0000000b |
| 0026320 | 0000001f | 00001c3f | 00002aff | 00000034 | 00071b0c | b27cb66c | 00000000 | 7fffffff | 00071b74 | 02000ce5 | 04002105 | 000024ff |
| 0026400 | 00000013 | 0000001f | 00001c3f | 00002aff | 00000034 | 00071b40 | b27cb66c | 00000000 | 7fffffff | 00071ba8 | 02000ce5 | 04002105 |
| 0026460 | 00002527 | 00000003 | 0000001f | 00001c3f | 00002aff | 00000034 | 00071b74 | b27cb66c | 00000000 | 7fffffff | 00071bdc | 02000ce5 |
| 0026540 | 04002105 | 00002527 | 0000000b | 0000001f | 00001c3f | 00002aff | 00000034 | 00071ba8 | b27cb66c | 00000000 | 7fffffff | 00071c10 |
| 0026620 | 02000ce5 | 04002105 | 00002567 | 00000003 | 00000027 | 00001c3f | 00002aff | 00000034 | 00071bdc | b27cb66c | 00000000 | 7fffffff |
| 0026700 | 00071c44 | 02000ce5 | 04002105 | 0000256f | 00000003 | 0000001f | 00001c3f | 00002aff | 00000034 | 00071c10 | b27cb66c | 00000000 |
| 0026760 | 7fffffff | 00071c78 | 02000ce5 | 04002105 | 00002577 | 00000003 | 0000001f | 00001c3f | 00002aff | 00000034 | 00071c44 | b27cb66c |
| 0027040 | 00000000 | 7fffffff | 00071cac | 02000ce5 | 04002105 | 0000257f | 00000003 | 0000001f | 00001c3f | 00002aff | 00000034 | 00071c78 |
| 0027120 | b27cb66c | 00000000 | 7fffffff | 00071ce0 | 02000ce5 | 04002105 | 00002597 | 0000000b | 0000001f | 00001c3f | 00002aff | 00000034 |
| 0027200 | 00071cac | b27cb66c | 00000000 | 7fffffff | 00071d14 | 02000ce5 | 04002105 | 000025b7 | 0000000b | 00000027 | 00001c3f | 00002aff |
| 0027260 | 00000034 | 00071ce0 | b27cb66c | 00000000 | 7fffffff | 00071d48 | 02000ce5 | 04002105 | 000025bf | 00000003 | 00000027 | 00001c3f |
| 0027340 | 00002aff | 00000034 | 00071d14 | b27cb66c | 00000000 | 7fffffff | 00071d7c | 02000ce5 | 04002105 | 000025cf | 00000003 | 00000027 |
| 0027420 | 00001c3f | 00002aff | 00000034 | 00071d48 | b27cb66c | 00000000 | 7fffffff | 00071db0 | 02000ce5 | 04002105 | 0000255f | 0000000b |
| 0027500 | 0000001f | 00001c3f | 00002aff | 00000034 | 00071d7c | b27cb66c | 00000000 | 7fffffff | 00071de4 | 02000ce5 | 04002105 | 000025e7 |
| 0027560 | 0000000b | 0000001f | 00001c3f | 00002aff | 00000034 | 00071db0 | b27cb66c | 00000000 | 7fffffff | 00071e18 | 02000ce5 | 04002105 |
| 0027640 | 000025f7 | 0000001b | 0000001f | 00001c3f | 00002aff | 00000034 | 00071de4 | b27cb66c | 00000000 | 7fffffff | 00071e4c | 02000ce5 |
| 0027720 | 04002105 | 000025ef | 00000013 | 0000001f | 00001c3f | 00002aff | 00000034 | 00071e18 | b27cb66c | 00000000 | 7fffffff | 00071e80 |
| 0030000 | 02000ce5 | 04002105 | 0000264f | 0000001b | 0000001f | 00001c3f | 00002aff | 00000034 | 00071e4c | b27cb66c | 00000000 | 7fffffff |
| 0030060 | 00071eb4 | 02000ce5 | 04002105 | 0000265f | 0000001b | 0000001f | 00001c3f | 00002aff | 00000034 | 00071e80 | b27cb66c | 00000000 |
| 0030140 | 7fffffff | 00071ee8 | 02000ce5 | 04002105 | 00002667 | 0000000b | 0000001f | 00001c3f | 00002aff | 00000034 | 00071eb4 | b27cb66c |
| 0030220 | 00000000 | 7fffffff | 00071f1c | 02000ce5 | 04002105 | 0000267f | 00000003 | 0000001f | 00001c3f | 00002aff | 00000034 | 00071ee8 |
| 0030300 | b27cb66c | 00000000 | 7fffffff | 00071f50 | 02000ce5 | 04002105 | 000026bf | 00000013 | 0000001f | 00001c3f | 00002aff | 00000034 |
| 0030360 | 00071f1c | b27cb66c | 00000000 | 7fffffff | 00071f84 | 02000ce5 | 04002105 | 000026bf | 0000001b | 0000001f | 00001c3f | 00002aff |
| 0030440 | 00000034 | 00071f50 | b27cb66c | 00000000 | 7fffffff | 00071fb8 | 02000ce5 | 04002105 | 000026c7 | 0000000b | 0000001f | 00001c3f |
| 0030520 | 00002aff | 00000034 | 00071f84 | b27cb66c | 00000000 | 7fffffff | 00071fec | 02000ce5 | 04002105 | 000026d7 | 0000000b | 0000001f |
| 0030600 | 00001c3f | 00002aff | 00000034 | 00071fb8 | b27cb66c | 00000000 | 7fffffff | 00072020 | 02000ce5 | 04002105 | 000026ff | 00000013 |
| 0030660 | 0000001f | 00001c3f | 00002aff | 00000034 | 00071fec | b27cb66c | 00000000 | 7fffffff | 00072054 | 02000ce5 | 04002105 | 0000271f |
| 0030740 | 0000000b | 0000001f | 00001c3f | 00002aff | 00000034 | 00072020 | b27cb66c | 00000000 | 7fffffff | 00072088 | 02000ce5 | 04002105 |
| 0031020 | 0000271f | 00000013 | 0000001f | 00001c3f | 00002aff | 00000034 | 00072054 | b27cb66c | 00000000 | 7fffffff | 000720bc | 02000ce5 |
| 0031100 | 04002105 | 0000273f | 00000013 | 0000001f | 00001c3f | 00002aff | 00000034 | 00072088 | b27cb66c | 00000000 | 7fffffff | 000720f0 |
| 0031160 | 02000ce5 | 04002105 | 0000273f | 0000001b | 0000001f | 00001c3f | 00002aff | 00000034 | 000720bc | b27cb66c | 00000000 | 7fffffff |
| 0031240 | 00072124 | 02000ce5 | 04002105 | 00002747 | 00000013 | 0000001f | 00001c3f | 00002aff | 00000034 | 000720f0 | b27cb66c | 00000000 |
| 0031320 | 7fffffff | 00072158 | 02000ce5 | 04002105 | 0000274f | 00000013 | 0000001f | 00001c3f | 00002aff | 00000034 | 00072124 | b27cb66c |
| 0031400 | 00000000 | 7fffffff | 0007218c | 02000ce5 | 04002105 | 00002757 | 0000000b | 0000001f | 00001c3f | 00002aff | 00000034 | 00072158 |
| 0031460 | b27cb66c | 00000000 | 7fffffff | 000721c0 | 02000ce5 | 04002105 | 0000275f | 0000000b | 0000001f | 00001c3f | 00002aff | 00000034 |
| 0031540 | 0007218c | b27cb66c | 00000000 | 7fffffff | 000721f4 | 02000ce5 | 04002105 | 0000275f | 00000013 | 0000001f | 00001c3f | 00002aff |
| 0031620 | 00000034 | 000721c0 | b27cb66c | 00000000 | 7fffffff | 00072228 | 02000ce5 | 04002105 | 0000279f | 0000000b | 0000001f | 00001c3f |
| 0031700 | 00002aff | 00000034 | 000721f4 | b27cb66c | 00000000 | 7fffffff | 0007225c | 02000ce5 | 04002105 | 0000279f | 00000013 | 0000001f |
| 0031760 | 00001c3f | 00002aff | 00000034 | 00072228 | b27cb66c | 00000000 | 7fffffff | 00072290 | 02000ce5 | 04002105 | 000027af | 0000000b |
| 0032040 | 0000001f | 00001c3f | 00002aff | 00000034 | 0007225c | b27cb66c | 00000000 | 7fffffff | 000722c4 | 02000ce5 | 04002105 | 000027b7 |
| 0032120 | 0000001b | 0000001f | 00001c3f | 00002aff | 00000034 | 00072290 | b27cb66c | 00000000 | 7fffffff | 000722f8 | 02000ce5 | 04002105 |
| 0032200 | 000027bf | 0000001b | 0000001f | 00001c3f | 00002aff | 00000034 | 000722c4 | b27cb66c | 00000000 | 7fffffff | 0007232c | 02000ce5 |
| 0032260 | 04002105 | 000027c7 | 0000001b | 0000001f | 00001c3f | 00002aff | 00000034 | 000722f8 | b27cb66c | 00000000 | 7fffffff | 00072360 |
| 0032340 | 02000ce5 | 04002105 | 000027df | 00000003 | 0000001f | 00001c3f | 00002aff | 00000034 | 0007232c | b27cb66c | 00000000 | 7fffffff |
| 0032420 | 00072394 | 02000ce5 | 04002105 | 000027ef | 00000003 | 0000001f | 00001c3f | 00002aff | 00000034 | 00072360 | b27cb66c | 00000000 |
| 0032500 | 7fffffff | 000723c8 | 02000ce5 | 04002105 | 000027ff | 0000000b | 0000001f | 00001c3f | 00002aff | 00000034 | 00072394 | b27cb66c |
| 0032560 | 00000000 | 7fffffff | 000723fc | 02000ce5 | 04002105 | 000027ff | 00000013 | 0000002f | 00001c3f | 00002aff | 00000034 | 000723c8 |
| 0032640 | b27cb66c | 00000000 | 7fffffff | 00072430 | 02000ce5 | 04002105 | 00002817 | 0000000b | 0000001f | 00001c3f | 00002aff | 00000034 |
| 0032720 | 000723fc | b27cb66c | 00000000 | 7fffffff | 00072464 | 02000ce5 | 04002105 | 00002827 | 0000000b | 0000001f | 00001c3f | 00002aff |
| 0033000 | 00000034 | 00072430 | b27cb66c | 00000000 | 7fffffff | 00072498 | 02000ce5 | 04002105 | 00002837 | 00000013 | 0000001f | 00001c3f |
| 0033060 | 00002aff | 00000034 | 00072464 | b27cb66c | 00000000 | 7fffffff | 000724cc | 02000ce5 | 04002105 | 0000285f | 0000000b | 0000001f |
| 0033140 | 00001c3f | 00002aff | 00000034 | 00072498 | b27cb66c | 00000000 | 7fffffff | 00072500 | 02000ce5 | 04002105 | 0000285f | 00000013 |

| | | | | | | | | | | | | |
|---|---|---|---|---|---|---|---|---|---|---|---|---|
| 0033220 | 0000001f | 00001c3f | 00002aff | 00000034 | 000724cc | b27cb66c | 00000000 | 7fffffff | 00072534 | 02000ce5 | 04002105 | 0000286f |
| 0033300 | 0000000b | 0000001f | 00001c3f | 00002aff | 00000034 | 00072500 | b27cb66c | 00000000 | 7fffffff | 00072568 | 02000ce5 | 04002105 |
| 0033360 | 0000298f | 0000000b | 0000001f | 00001c3f | 00002aff | 00000034 | 00072534 | b27cb66c | 00000000 | 7fffffff | 0007259c | 02000ce5 |
| 0033440 | 04002105 | 00002897 | 0000000b | 0000001f | 00001c3f | 00002aff | 00000034 | 00072568 | b27cb66c | 00000000 | 7fffffff | 000725d0 |
| 0033520 | 02000ce5 | 04002105 | 0000289f | 00000003 | 0000001f | 00001c3f | 00002aff | 00000034 | 0007259c | b27cb66c | 00000000 | 7fffffff |
| 0033600 | 00072604 | 02000ce5 | 04002105 | 000028a7 | 0000000b | 0000001f | 00001c3f | 00002aff | 00000034 | 000725d0 | b27cb66c | 00000000 |
| 0033660 | 7fffffff | 00072638 | 02000ce5 | 04002105 | 000028b7 | 0000000b | 0000001f | 00001c3f | 00002aff | 00000034 | 00072604 | b27cb66c |
| 0033740 | 00000000 | 7fffffff | 0007266c | 02000ce5 | 04002105 | 000028bf | 0000001b | 0000001f | 00001c3f | 00002aff | 00000034 | 00072638 |
| 0034020 | b27cb66c | 00000000 | 7fffffff | 000726a0 | 02000ce5 | 04002105 | 000028ff | 0000000b | 0000001f | 00001c3f | 00002aff | 00000034 |
| 0034100 | 0007266c | b27cb66c | 00000000 | 7fffffff | 000726d4 | 02000ce5 | 04002105 | 000028ff | 00000013 | 0000001f | 00001c3f | 00002aff |
| 0034160 | 00000034 | 000726a0 | b27cb66c | 00000000 | 7fffffff | 00072708 | 02000ce5 | 04002105 | 00002927 | 00000013 | 0000001f | 00001c3f |
| 0034240 | 00002aff | 00000034 | 00072614 | b27cb66c | 00000000 | 7fffffff | 0007273c | 02000ce5 | 04002105 | 00002937 | 0000000b | 0000001f |
| 0034320 | 00001c3f | 00002aff | 00000034 | 00072708 | b27cb66c | 00000000 | 7fffffff | 00072770 | 02000ce5 | 04002105 | 00002937 | 00000013 |
| 0034400 | 0000001f | 00001c3f | 00002aff | 00000034 | 0007273c | b27cb66c | 00000000 | 7fffffff | 000727a4 | 02000ce5 | 04002105 | 00002957 |
| 0034460 | 0000000b | 00000027 | 00001c3f | 00002aff | 00000034 | 00072770 | b27cb66c | 00000000 | 7fffffff | 000727d8 | 02000ce5 | 04002105 |
| 0034540 | 00002997 | 00000003 | 0000001f | 00001c3f | 00002aff | 00000034 | 000727a4 | b27cb66c | 00000000 | 7fffffff | 0007280c | 02000ce5 |
| 0034620 | 04002105 | 00002997 | 00000013 | 0000001f | 00001c3f | 00002aff | 00000034 | 000727d8 | b27cb66c | 00000000 | 7fffffff | 00072840 |
| 0034700 | 02000ce5 | 04002105 | 000029bf | 00000013 | 0000001f | 00001c3f | 00002aff | 00000034 | 0007280c | b27cb66c | 00000000 | 7fffffff |
| 0034760 | 00072874 | 02000ce5 | 04002105 | 000029c7 | 00000013 | 0000001f | 00001c3f | 00002aff | 00000034 | 00072840 | b27cb66c | 00000000 |
| 0035040 | 7fffffff | 000728a8 | 02000ce5 | 04002105 | 000029c7 | 0000001b | 0000001f | 00001c3f | 00002aff | 00000034 | 00072874 | b27cb66c |
| 0035120 | 00000000 | 7fffffff | 000728dc | 02000ce5 | 04002105 | 000029ef | 0000000b | 0000001f | 00001c3f | 00002aff | 00000034 | 000728a8 |
| 0035200 | b27cb66c | 00000000 | 7fffffff | 00072910 | 02000ce5 | 04002105 | 000029f7 | 0000000b | 00000027 | 00001c3f | 00002aff | 00000034 |
| 0035260 | 000728dc | b27cb66c | 00000000 | 7fffffff | 00072944 | 02000ce5 | 04002105 | 000029ff | 00000013 | 0000001f | 00001c3f | 00002aff |
| 0035340 | 00000034 | 00072910 | b27cb66c | 00000000 | 7fffffff | 00072978 | 02000ce5 | 04002105 | 00002a27 | 0000000b | 0000001f | 00001c3f |
| 0035420 | 00002aff | 00000034 | 00072944 | b27cb66c | 00000000 | 7fffffff | 000729ac | 02000ce5 | 04002105 | 00002a27 | 00000013 | 0000001f |
| 0035500 | 00001c3f | 00002aff | 00000034 | 00072978 | b27cb66c | 00000000 | 7fffffff | 000729e0 | 02000ce5 | 04002105 | 00002a37 | 0000000b |
| 0035560 | 0000001f | 00001c3f | 00002aff | 00000034 | 000729ac | b27cb66c | 00000000 | 7fffffff | 00072a14 | 02000ce5 | 04002105 | 00002a3f |
| 0035640 | 0000000b | 0000001f | 00001c3f | 00002aff | 00000034 | 000729e0 | b27cb66c | 00000000 | 7fffffff | 00072a48 | 02000ce5 | 04002105 |
| 0035720 | 00002a97 | 00000003 | 0000001f | 00001c3f | 00002aff | 00000034 | 00072a14 | b27cb66c | 00000000 | 7fffffff | 00072a7c | 02000ce5 |
| 0036000 | 04002105 | 00002abf | 00000003 | 00000027 | 00001c3f | 00002aff | 00000034 | 00072a48 | b27cb66c | 00000000 | 7fffffff | 00072ab0 |
| 0036060 | 02000ce5 | 04002105 | 00002af7 | 00000003 | 0000001f | 00001c3f | 00002aff | 00000034 | 00072a7c | b27cb66c | 00000000 | 7fffffff |
| 0036140 | 00072ae4 | 02000ce5 | 04002105 | 00002aff | 00000003 | 0000001f | 00001c3f | 00002aff | 00000034 | 00072ab0 | b27cb66c | 00000000 |
| 0036220 | 7fffffff | 00072b18 | 02000ce5 | 04002105 | 00002b17 | 00000003 | 0000001f | 00001c3f | 00002aff | 00000034 | 00072ae4 | b27cb66c |
| 0036300 | 00000000 | 7fffffff | 00072b4c | 02000ce5 | 04002105 | 00002b1f | 0000000b | 0000001f | 00001c3f | 00002aff | 00000034 | 00072b18 |
| 0036360 | b27cb66c | 00000000 | 7fffffff | 00072b80 | 02000ce5 | 04002105 | 00002b27 | 0000000b | 0000001f | 00001c3f | 00002aff | 00000034 |
| 0036440 | 00072b4c | b27cb66c | 00000000 | 7fffffff | 00072bb4 | 02000ce5 | 04002105 | 00002b2f | 00000003 | 0000001f | 00001c3f | 00002aff |
| 0036520 | 00000034 | 00072b80 | b27cb66c | 00000000 | 7fffffff | 00072be8 | 02000ce5 | 04002105 | 00002b37 | 0000000b | 0000001f | 00001c3f |
| 0036600 | 00002aff | 00000034 | 00072bb4 | b27cb66c | 00000000 | 7fffffff | 00072c1c | 02000ce5 | 04002105 | 00002b3f | 0000000b | 0000001f |
| 0036660 | 00001c3f | 00002aff | 00000034 | 00072be8 | b27cb66c | 00000000 | 7fffffff | 00072c50 | 02000ce5 | 04002105 | 00002b47 | 0000000b |
| 0036740 | 0000001f | 00001c3f | 00002aff | 00000034 | 00072c1c | b27cb66c | 00000000 | 7fffffff | 00072c84 | 02000ce5 | 04002105 | 00002bbf |
| 0037020 | 0000000b | 0000001f | 00001c3f | 00002aff | 00000034 | 00072c50 | b27cb66c | 00000000 | 7fffffff | 00072cb8 | 02000ce5 | 04002105 |
| 0037100 | 00002bc7 | 00000013 | 0000001f | 00001c3f | 00002aff | 00000034 | 00072c84 | b27cb66c | 00000000 | 7fffffff | 00072cec | 02000ce5 |
| 0037160 | 04002105 | 00002bf7 | 0000000b | 0000001f | 00001c3f | 00002aff | 00000034 | 00072cb8 | b27cb66c | 00000000 | 7fffffff | 00072d20 |
| 0037240 | 02000ce5 | 04002105 | 00002bf7 | 00000013 | 0000001f | 00001c3f | 00002aff | 00000034 | 00072cec | b27cb66c | 00000000 | 7fffffff |
| 0037320 | 00072d54 | 02000ce5 | 04002105 | 00002bf7 | 0000001b | 0000001f | 00001c3f | 00002aff | 00000034 | 00072d20 | b27cb66c | 00000000 |
| 0037400 | 7fffffff | 00072d88 | 02000ce5 | 04002105 | 00002c57 | 0000000b | 0000001f | 00001c3f | 00002aff | 00000034 | 00072d54 | b27cb66c |
| 0037460 | 00000000 | 7fffffff | 00072dbc | 02000ce5 | 04002105 | 00002c87 | 00000003 | 0000001f | 00001c3f | 00002aff | 00000034 | 00072d88 |
| 0037540 | b27cb66c | 00000000 | 7fffffff | 00072df0 | 02000ce5 | 04002105 | 00002c87 | 0000000b | 0000001f | 00001c3f | 00002aff | 00000034 |
| 0037620 | 00072dbc | b27cb66c | 00000000 | 7fffffff | 00072e24 | 02000ce5 | 04002105 | 00002c8f | 0000000b | 0000001f | 00001c3f | 00002aff |
| 0037700 | 00000034 | 00072df0 | b27cb66c | 00000000 | 7fffffff | 00072e58 | 02000ce5 | 04002105 | 00002c8f | 00000013 | 0000001f | 00001c3f |
| 0037760 | 00002aff | 00000034 | 00072e24 | b27cb66c | 00000000 | 7fffffff | 00072e8c | 02000ce5 | 04002105 | 00002cef | 0000000b | 0000001f |
| 0040040 | 00001c3f | 00002aff | 00000034 | 00072e58 | b27cb66c | 00000000 | 7fffffff | 00072ec0 | 02000ce5 | 04002105 | 00002cef | 00000013 |
| 0040120 | 0000001f | 00001c3f | 00002aff | 00000034 | 00072e8c | b27cb66c | 00000000 | 7fffffff | 00072ef4 | 02000ce5 | 04002105 | 00002d0f |
| 0040200 | 0000000b | 0000001f | 00001c3f | 00002aff | 00000034 | 00072ec0 | b27cb66c | 00000000 | 7fffffff | 00072f28 | 02000ce5 | 04002105 |
| 0040260 | 00002d0f | 00000013 | 0000001f | 00001c3f | 00002aff | 00000034 | 00072ef4 | b27cb66c | 00000000 | 7fffffff | 00072f5c | 02000ce5 |

```
0040340  04002105 00002d07 0000000b 0000001f 00001c3f 00002aff 00000034 00072f28 b27cb66c 00000000 7fffffff 00072f90
0040420  02000ce5 04002105 00002d07 00000013 0000001f 00001c3f 00002aff 00000034 00072f5c b27cb66c 00000000 7fffffff
0040500  00072fc4 02000ce5 04002105 00001647 0000000b 0000001f 00001c3f 00002aff 00000034 00072f90 b27cb66c 00000000
0040560  7fffffff 00072ff8 02000ce5 04002105 0000166f 00000013 0000001f 00001c3f 00002aff 00000034 00072fc4 b27cb66c
0040640  00000000 7fffffff 0007302c 02000ce5 04002105 00000d37 00000013 0000001f 00001c3f 00002aff 00000034 00072ff8
0040720  b27cb66c 00000000 7fffffff 00073060 02000ce5 04002105 00000d4f 00000013 0000001f 00001c3f 00002aff 00000034
0041000  0007302c b27cb66c 00000000 7fffffff 00073094 02000ce5 04002105 00000d17 00000013 0000001f 00001c3f 00002aff
0041060  00000034 00073060 b27cb66c 00000000 7fffffff 000730c8 02000ce5 04002105 00000d3f 00000013 0000001f 00001c3f
0041140  00002aff 00000034 00073094 b27cb66c 00000000 7fffffff 000730fc 02000ce5 04002105 00000157 00000013 0000001f
0041220  00001c3f 00002aff 00000034 000730c8 b27cb66c 00000000 7fffffff 00073130 02000ce5 04002105 00000d5f 00000013
0041300  0000001f 00001c3f 00002aff 00000034 000730fc b27cb66c 00000000 7fffffff 00073164 02000ce5 04002105 00000d27
0041360  00000013 0000001f 00001c3f 00002aff 00000034 00073130 b27cb66c 00000000 7fffffff 00073198 02000ce5 04002105
0041440  00000d2f 00000013 0000001f 00001c3f 00002aff 00000034 00073164 b27cb66c 00000000 7fffffff 000731cc 02000ce5
0041520  04002105 00000d47 00000013 0000001f 00001c3f 00002aff 00000034 00073198 b27cb66c 00000000 7fffffff 00073200
0041600  02000ce5 04002105 00001657 00000013 0000001f 00001c3f 00002aff 00000034 000731cc b27cb66c 00000000 7fffffff
0041660  00073234 02000ce5 04002105 00000d7f 00000013 0000001f 00001c3f 00002aff 00000034 00073200 b27cb66c 00000000
0041740  7fffffff 00073268 02000ce5 04002105 00000d87 00000013 0000001f 00001c3f 00002aff 00000034 00073234 b27cb66c
0042020  00000000 7fffffff 0007329c 02000ce5 04002105 00000d8f 00000013 0000001f 00001c3f 00002aff 00000034 00073268
0042100  b27cb66c 00000000 7fffffff 000732d0 02000ce5 04002105 00000d97 00000013 0000001f 00001c3f 00002aff 00000034
0042160  0007329c b27cb66c 00000000 7fffffff 00073304 02000ce5 04002105 0000000f 00000013 0000001f 00001c3f 00002aff
0042240  00000034 000732d0 b27cb66c 00000000 7fffffff 00073338 02000ce5 04002105 00000cdf 00000013 00000027 00001c3f
0042320  00002aff 00000034 00073304 b27cb66c 00000000 7fffffff 0007336c 02000ce5 04002105 00000007 00000003 0000001f
0042400  00001c3f 00002aff 00000034 00073338 b27cb66c 00000000 7fffffff 000733a0 02000ce5 04002105 0000083f 00000003
0042460  0000001f 00001c3f 00002aff 00000034 0007336c b27cb66c 00000000 7fffffff 000733d4 02000ce5 04002105 00000a3f
0042540  00000013 0000001f 00001c3f 00002aff 00000034 000733a0 b27cb66c 00000000 7fffffff 00073408 02000ce5 04002105
0042620  00000d0f 00000013 0000001f 00001c3f 00002aff 00000034 000733d4 b27cb66c 00000000 7fffffff 0007343c 02000ce5
0042700  04002105 00000a67 00000013 0000001f 00001c3f 00002aff 00000034 00073408 b27cb66c 00000000 7fffffff 00073470
0042760  02000ce5 04002105 00000d77 0000000b 0000001f 00001c3f 00002aff 00000034 0007343c b27cb66c 00000000 7fffffff
0043040  000734a4 02000ce5 04002105 00000ce7 0000000b 0000001f 00001c3f 00002aff 00000034 00073470 b27cb66c 00000000
0043120  7fffffff 000734d8 02000ce5 04002105 00000ce7 00000013 0000001f 00001c3f 00002aff 00000034 000734a4 b27cb66c
0043200  00000000 7fffffff 0007350c 02000ce5 04002105 000008f7 0000000b 0000001f 00001c3f 00002aff 00000034 000734d8
0043260  b27cb66c 00000000 7fffffff 00073540 02000ce5 04002105 000008a7 0000000b 0000001f 00001c3f 00002aff 00000034
0043340  0007350c b27cb66c 00000000 7fffffff 00073574 02000ce5 04002105 000008ef 00000013 0000001f 00001c3f 00002aff
0043420  00000034 00073540 b27cb66c 00000000 7fffffff 000735a8 02000ce5 04002105 000008bf 0000000b 0000001f 00001c3f
0043500  00002aff 00000034 00073574 b27cb66c 00000000 7fffffff 000735dc 02000ce5 04002105 000008e7 0000001b 0000001f
0043560  00001c3f 00002aff 00000034 000735a8 b27cb66c 00000000 7fffffff 00073610 02000ce5 04002105 000008d7 0000001b
0043640  0000001f 00001c3f 00002aff 00000034 000735dc b27cb66c 00000000 7fffffff 00073644 02000ce5 04002105 000008df
0043720  00000013 0000001f 00001c3f 00002aff 00000034 00073610 b27cb66c 00000000 7fffffff 00073678 02000ce5 04002105
0044000  000008c7 00000023 0000001f 00001c3f 00002aff 00000034 00073644 b27cb66c 00000000 7fffffff 000a0fc8 02000ce5
0044060  04002105 000008cf 0000000b 0000001f 00001c3f 00002aff 0000002c 000736ac b4f0b4e4 00000000 7fffffff 0007fc2d
0044140  000000fc 0000002d 000736d8 00094164 00093fa4 00000030 000a14b0 b27cb66c 00000000 7fffffff 00073708 02000ce5
0044220  020024ad 01001c65 00000003 00000027 00002aff 00000030 000736d8 b27cb66c 00000000 7fffffff 00073738 02000ce5
0044300  020024ad 010021ad 00000003 00000027 00002aff 00000034 00073708 b27cb66c 00000000 7fffffff 0007376c 02000ce5
0044360  020024ad 0200166d 00000a57 00000003 0000001f 00002aff 00000030 00073738 b27cb66c 00000000 7fffffff 0007379c
0044440  02000ce5 020024ad 01002955 00000cdf 00000027 00002aff 00000030 0007376c b27cb66c 00000000 7fffffff 000737cc
0044520  02000ce5 020024ad 010025b5 00000cdf 00000027 00002aff 00000034 0007379c b27cb66c 00000000 7fffffff 00073800
0044600  02000ce5 020024ad 020026b1 00000013 00000d6f 0000001f 00002aff 00000038 000737cc b27cb66c 00000000 7fffffff
0044660  00073838 02000ce5 020024a1 030026bd 00000013 00000d6f 00000d6f 0000001f 00002aff 00000038 00073800 b27cb66c
0044740  00000000 7fffffff 00073870 02000ce5 020024ad 030028bd 00000a37 00000003 00000d6f 0000001f 00002aff 00000038
0045020  00073838 b27cb66c 00000000 7fffffff 000738a8 02000ce5 020024ad 03001bed 00000a37 00000003 00000d6f 0000001f
0045100  00002aff 00000038 00073870 b27cb66c 00000000 7fffffff 000738e0 02000ce5 020024ad 03001fa5 00000a37 00000003
0045160  00000d6f 0000001f 00002aff 00000030 000738a8 b27cb66c 00000000 7fffffff 00073910 02000ce5 020024ad 01001b75
0045240  00000cdf 0000001f 00002aff 00000034 000738e0 b27cb66c 00000000 7fffffff 00073944 02000ce5 020024ad 02001b75
0045320  00000cdf 00000a57 0000001f 00002aff 00000030 00073910 b27cb66c 00000000 7fffffff 00073974 02000ce5 020024ad
0045400  01001b7d 00000cdf 0000001f 00002aff 00000034 00073944 b27cb66c 00000000 7fffffff 000739a8 02000ce5 020024ad
```

| | | | | | | | | | | | | |
|---|---|---|---|---|---|---|---|---|---|---|---|---|
| 0045460 | 02001b7d | 00000cdf | 00000a57 | 0000001f | 00002aff | 00000030 | 00073974 | b27cb66c | 00000000 | 7fffffff | 000739d8 | 02000ce5 |
| 0045540 | 020024ad | 01001b85 | 00000cdf | 0000001f | 00002aff | 00000034 | 000739a8 | b27cb66c | 00000000 | 7fffffff | 00073a0c | 02000ce5 |
| 0045620 | 020024ad | 02001b85 | 00000cdf | 00000a57 | 0000001f | 00002aff | 00000030 | 000739d8 | b27cb66c | 00000000 | 7fffffff | 00073a3c |
| 0045700 | 02000ce5 | 020024ad | 01002815 | 00000cdf | 0000001f | 00002aff | 00000030 | 00073a0c | b27cb66c | 00000000 | 7fffffff | 00073a6c |
| 0045760 | 02000ce5 | 020024ad | 01002825 | 00000003 | 0000001f | 00002aff | 00000034 | 00073a3c | b27cb66c | 00000000 | 7fffffff | 00073aa0 |
| 0046040 | 02000ce5 | 020024ad | 02001d1d | 00000cdf | 00000d6f | 0000001f | 00002aff | 00000038 | 00073a6c | b27cb66c | 00000000 | 7fffffff |
| 0046120 | 00073ad8 | 02000ce5 | 020024ad | 03001d1d | 00000cdf | 00000d6f | 00000d6f | 0000001f | 00002aff | 00000030 | 00073aa0 | b27cb66c |
| 0046200 | 00000000 | 7fffffff | 00073b08 | 02000ce5 | 020024ad | 01001aad | 00000cdf | 0000001f | 00002aff | 00000034 | 00073ad8 | b27cb66c |
| 0046260 | 00000000 | 7fffffff | 00073b3c | 02000ce5 | 020024ad | 02001aad | 00000cdf | 00000a37 | 0000001f | 00002aff | 00000034 | 00073b08 |
| 0046340 | b27cb66c | 00000000 | 7fffffff | 00073b70 | 02000ce5 | 020024ad | 02001de5 | 00000d6f | 00000003 | 0000001f | 00002aff | 00000034 |
| 0046420 | 00073b3c | b27cb66c | 00000000 | 7fffffff | 00073ba4 | 02000ce5 | 020024ad | 02002935 | 00000003 | 00000d6f | 0000001f | 00002aff |
| 0046500 | 00000034 | 00073b70 | b27cb66c | 00000000 | 7fffffff | 00073bd8 | 02000ce5 | 020024ad | 020026fd | 00000003 | 00000d6f | 0000001f |
| 0046560 | 00002aff | 00000030 | 00073ba4 | b27cb66c | 00000000 | 7fffffff | 00073c08 | 02000ce5 | 020024ad | 01002335 | 00000cdf | 0000001f |
| 0046640 | 00002aff | 00000030 | 00073bd8 | b27cb66c | 00000000 | 7fffffff | 00073c38 | 02000ce5 | 020024ad | 01001d7d | 00000cdf | 0000001f |
| 0046720 | 00002aff | 00000034 | 00073c08 | b27cb66c | 00000000 | 7fffffff | 00073c6c | 02000ce5 | 020024ad | 00000001 | 00000cdf | 00000a37 |
| 0047000 | 0000001f | 00002aff | 00000030 | 00073c38 | b27cb66c | 00000000 | 7fffffff | 00073c9c | 02000ce5 | 020024ad | 01001d55 | 00000cdf |
| 0047060 | 0000001f | 00002aff | 00000030 | 00073c6c | b27cb66c | 00000000 | 7fffffff | 00073ccc | 02000ce5 | 020024ad | 01001ebd | 00000cdf |
| 0047140 | 0000001f | 00002aff | 00000030 | 00073c9c | b27cb66c | 00000000 | 7fffffff | 00073cfc | 02000ce5 | 020024ad | 01002bf5 | 00000cdf |
| 0047220 | 0000001f | 00002aff | 00000034 | 00073ccc | b27cb66c | 00000000 | 7fffffff | 00073d30 | 02000ce5 | 020024ad | 02002bf5 | 00000cdf |
| 0047300 | 00000a37 | 0000001f | 00002aff | 00000038 | 00073cfc | b27cb66c | 00000000 | 7fffffff | 00073d68 | 02000ce5 | 020024ad | 03002bf5 |
| 0047360 | 00000a37 | 00000cdf | 00000a37 | 0000001f | 00002aff | 00000034 | 00073d30 | b27cb66c | 00000000 | 7fffffff | 00073d9c | 02000ce5 |
| 0047440 | 020024ad | 02002355 | 00000cdf | 00000a37 | 0000002f | 00002aff | 00000038 | 00073d68 | b27cb66c | 00000000 | 7fffffff | 00073dd4 |
| 0047520 | 02000ce5 | 020024ad | 03002355 | 00000cdf | 00000a37 | 00000a37 | 0000002f | 00002aff | 00000038 | 00073d9c | b27cb66c | 00000000 |
| 0047600 | 7fffffff | 00073e0c | 02000ce5 | 020024ad | 030008e5 | 00000cdf | 00000cdf | 00000cdf | 0000001f | 00002aff | 0000003c | 00073dd4 |
| 0047660 | b27cb66c | 00000000 | 7fffffff | 00073e48 | 02000ce5 | 020024ad | 040008c5 | 00000a37 | 00000a37 | 00000a37 | 00000003 | 0000001f |
| 0047740 | 00002aff | 00000030 | 00073e0c | b27cb66c | 00000000 | 7fffffff | 000a12c0 | 02000ce5 | 020024ad | 010024ed | 00000cdf | 0000001f |
| 0050020 | 00002aff | 00000000 | 00000000 | 00000000 | 00000000 | 00000000 | 00000000 | 00000000 | 00000000 | 00000000 | 00000000 | 0007e43c |
| 0050100 | ffffffff | 00000017 | 0000001f | 00000000 | 000496d0 | 000496d0 | 0081002a | 00000000 | 00073e9c | 00000017 | 0000001f | 00000000 |
| 0050160 | 0005772c | 00057770 | 00810035 | 00000000 | 00073ebc | 00000017 | 0000001f | 00000000 | 0003286c | 0003286c | 00810010 | 00000000 |
| 0050240 | 00073edc | 00000017 | 00000027 | 00000000 | 000493ec | 00049434 | 00810029 | 00000000 | 00073efc | 00000017 | 0000001f | 00000000 |
| 0050320 | 00057864 | 00057864 | 00810035 | 00000000 | 00073f1c | 00000017 | 0000001f | 00000000 | 00057844 | 00057858 | 00810035 | 00000000 |
| 0050400 | 00073f3c | 00000017 | 00000027 | 00000000 | 00049450 | 000494b4 | 00810029 | 00000000 | 00073f5c | 00000017 | 0000001f | 00000000 |
| 0050460 | 00040108 | 00040108 | 0081001e | 00000000 | 00073f7c | 00000017 | 0000001f | 00000000 | 0003fab8 | 0003fab8 | 0081001e | 00000000 |
| 0050540 | 00073f9c | 00000017 | 0000001f | 00000000 | 0003fdf0 | 0003fdf0 | 0081001e | 00000000 | 00073fbc | 00000017 | 0000001f | 00000000 |
| 0050620 | 0004120c | 0004120c | 00810023 | 00000000 | 00073fdc | 00000017 | 0000001f | 00000000 | 00049fa0 | 00049fa0 | 0081002a | 00000000 |
| 0050700 | 00073ffc | 00000017 | 0000001f | 00000000 | 00058664 | 00058664 | 00810035 | 00000000 | 0007401c | 00000017 | 0000001f | 00000000 |
| 0050760 | 00049660 | 000496b8 | 0081002a | 00000000 | 0007403c | 00000017 | 0000001f | 00000000 | 0005a014 | 0005a014 | 00810039 | 00000000 |
| 0051040 | 0007405c | 00000017 | 0000001f | 00000000 | 00049814 | 000498e4 | 0081002a | 00000000 | 0007407c | 00000017 | 0000001f | 00000000 |
| 0051120 | 0003f904 | 0003f904 | 0081001e | 00000000 | 0007409c | 00000017 | 0000001f | 00000000 | 00026d20 | 00026d20 | 00810003 | 00000000 |
| 0051200 | 000740bc | 00000017 | 0000001f | 00000000 | 0003c0d0 | 0003c0d0 | 00a10018 | 00000000 | 000740dc | 00000017 | 0000001f | 00000000 |
| 0051260 | 00036374 | 000363a0 | 00810012 | 00000000 | 000740fc | 00000017 | 0000001f | 00000000 | 00049f78 | 00049f94 | 0081002a | 00000000 |
| 0051340 | 0007411c | 00000017 | 0000001f | 00000000 | 00026cf0 | 00026cf0 | 00810003 | 00000000 | 0007413c | 00000017 | 0000001f | 00000000 |
| 0051420 | 00033050 | 0003307c | 00810010 | 00000000 | 0007415c | 00000017 | 0000001f | 00000000 | 0003cb14 | 0003cb14 | 00a10018 | 00000000 |
| 0051500 | 0007417c | 00000017 | 0000001f | 00000000 | 0003f8c8 | 0003f8c8 | 0081001e | 00000000 | 0007419c | 00000017 | 0000001f | 00000000 |
| 0051560 | 0003f80c | 0003f80c | 0081001e | 00000000 | 000741bc | 00000017 | 0000001f | 00000000 | 0003f8a4 | 0003f8bc | 0081001e | 00000000 |
| 0051640 | 000741dc | 00000017 | 0000001f | 00000000 | 0003f948 | 0003f948 | 0081001e | 00000000 | 000741fc | 00000017 | 0000002f | 00000000 |
| 0051720 | 00058bac | 00058bac | 00810037 | 00000000 | 0007421c | 00000017 | 0000001f | 00000000 | 0003f964 | 0003f964 | 0081001e | 00000000 |
| 0052000 | 0007423c | 00000017 | 0000001f | 00000000 | 0003f924 | 0003f924 | 0081001e | 00000000 | 0007425c | 00000017 | 0000001f | 00000000 |
| 0052060 | 0003f8e4 | 0003f8e4 | 0081001e | 00000000 | 0007427c | 00000017 | 0000001f | 00000000 | 000281cc | 000281cc | 00810008 | 00000000 |
| 0052140 | 0007429c | 00000017 | 0000001f | 00000000 | 0003c164 | 0003c164 | 00a10018 | 00000000 | 000742bc | 00000017 | 00000027 | 00000000 |
| 0052220 | 00045dcc | 00045dcc | 00810029 | 00000000 | 000742dc | 00000017 | 0000001f | 00000000 | 0004135c | 0004135c | 00810023 | 00000000 |
| 0052300 | 000742fc | 00000017 | 0000001f | 00000000 | 00057a44 | 00057a44 | 00810035 | 00000000 | 0007431c | 00000017 | 0000001f | 00000000 |
| 0052360 | 00033e04 | 00033e04 | 00810011 | 00000000 | 0007433c | 00000017 | 0000001f | 00000000 | 00057610 | 00057610 | 00810035 | 00000000 |
| 0052440 | 0007435c | 00000017 | 0000001f | 00000000 | 0005792c | 00057978 | 00810035 | 00000000 | 0007437c | 00000017 | 0000001f | 00000000 |
| 0052520 | 00028208 | 00028208 | 00810009 | 00000000 | 0007439c | 00000017 | 0000001f | 00000000 | 00032004 | 00032040 | 00810010 | 00000000 |

| | | | | | | | | | | | | |
|---|---|---|---|---|---|---|---|---|---|---|---|---|
| 0052600 | 000743bc | 00000017 | 0000001f | 00000000 | 000367a4 | 000367d4 | 00810012 | 00000000 | 000743dc | 00000017 | 0000001f | 00000000 |
| 0052660 | 0003c754 | 0003c754 | 00a10018 | 00000000 | 000743fc | 00000017 | 0000001f | 00000000 | 000260c0 | 000260cc | 00810003 | 00000000 |
| 0052740 | 0007441c | 00000017 | 0000001f | 00000000 | 00026e1c | 00026e1c | 00810003 | 00000000 | 0007443c | 00000017 | 0000001f | 00000000 |
| 0053020 | 00035ba0 | 00035bc0 | 00810012 | 00000000 | 0007445c | 00000017 | 0000001f | 00000000 | 00049f38 | 00049f38 | 0081002a | 00000000 |
| 0053100 | 0007447c | 00000017 | 00000027 | 00000000 | 000484b0 | 000484d0 | 00810029 | 00000000 | 0007449c | 00000017 | 0000001f | 00000000 |
| 0053160 | 0003f510 | 0003f510 | 0081001c | 00000000 | 000744bc | 00000017 | 0000001f | 00000000 | 000366b0 | 000366b0 | 00810012 | 00000000 |
| 0053240 | 000744dc | 01000017 | 0000001f | 00000004 | 0003cae0 | 0003cae0 | 00a10018 | 00000000 | 000744fc | 01000017 | 00000027 | 00000004 |
| 0053320 | 00046e04 | 00046e04 | 00810027 | 00000000 | 0007451c | 01000017 | 0000001f | 00000004 | 000443d4 | 00044428 | 00810027 | 00000000 |
| 0053400 | 0007453c | 01000017 | 0000001f | 00000004 | 00049a68 | 00049a90 | 0081002a | 00000000 | 0007455c | 01000017 | 00000037 | 00000004 |
| 0053460 | 0002f534 | 0002f534 | 0081000d | 00000000 | 0007457c | 01000017 | 0000001f | 00000004 | 0003c088 | 0003c088 | 00a10018 | 00000000 |
| 0053540 | 0007459c | 01000017 | 0000001f | 00000004 | 0003c070 | 0003c070 | 00a10018 | 00000000 | 000745bc | 01000017 | 0000001f | 00000004 |
| 0053620 | 000374f8 | 00037514 | 00810014 | 00000000 | 000745dc | 01000017 | 0000001f | 00000004 | 00042220 | 00042220 | 00810024 | 00000000 |
| 0053700 | 000745fc | 01000017 | 0000001f | 00000004 | 0003f4c0 | 0003f4c0 | 0081001c | 00000000 | 0007461c | 01000017 | 0000001f | 00000004 |
| 0053760 | 00033924 | 00033924 | 00810010 | 00000000 | 0007463c | 01000017 | 0000001f | 00000004 | 000336dc | 000336dc | 00810010 | 00000000 |
| 0054040 | 0007465c | 01000017 | 0000001f | 00000004 | 000374a4 | 000374d4 | 00810014 | 00000000 | 0007467c | 01000017 | 0000001f | 00000004 |
| 0054120 | 00031d04 | 00031d04 | 00810010 | 00000000 | 0007469c | 01000017 | 0000001f | 00000004 | 00038fe0 | 00038fe0 | 00810014 | 00000000 |
| 0054200 | 000746bc | 01000017 | 0000001f | 00000004 | 0003907c | 000390dc | 00810014 | 00000000 | 000746dc | 01000017 | 0000001f | 00000004 |
| 0054260 | 0002c5b0 | 0002c5b0 | 0081000c | 00000000 | 000746fc | 01000017 | 0000001f | 00000004 | 00037e5c | 00037e5c | 00810014 | 00000000 |
| 0054340 | 0007471c | 01000017 | 0000001f | 00000004 | 0003c39c | 0003c39c | 00a10018 | 00000000 | 0007473c | 01000017 | 0000001f | 00000004 |
| 0054420 | 000427c0 | 000427c0 | 00810024 | 00000000 | 0007475c | 01000017 | 00000027 | 00000004 | 00031828 | 00031828 | 0081000f | 00000000 |
| 0054500 | 0007477c | 01000017 | 0000001f | 00000004 | 0002a888 | 0002a888 | 0081000a | 00000000 | 0007479c | 01000017 | 0000001f | 00000004 |
| 0054560 | 0003c058 | 0003c058 | 00a10018 | 00000000 | 000747bc | 01000017 | 0000001f | 00000004 | 000373a4 | 000373b8 | 00810014 | 00000000 |
| 0054640 | 000747dc | 01000017 | 0000001f | 00000004 | 00037a64 | 00037a9c | 00810014 | 00000000 | 000747fc | 01000017 | 0000001f | 00000004 |
| 0054720 | 00026ed8 | 00026ed8 | 00810003 | 00000000 | 0007481c | 01000017 | 0000001f | 00000004 | 00026fc8 | 00027030 | 00810003 | 00000000 |
| 0055000 | 0007483c | 01000017 | 0000001f | 00000004 | 0003c5e4 | 0003c5e4 | 00a10018 | 00000000 | 0007485c | 01000017 | 0000001f | 00000004 |
| 0055060 | 0004b1ac | 0004b1ac | 0081002d | 00000000 | 0007487c | 01000017 | 0000001f | 00000004 | 00027884 | 00027884 | 00810005 | 00000000 |
| 0055140 | 0007489c | 01000017 | 0000001f | 00000004 | 0002784c | 0002784c | 00810005 | 00000000 | 000748bc | 01000017 | 0000001f | 00000004 |
| 0055220 | 0003c9d0 | 0003c9d0 | 00a10018 | 00000000 | 000748dc | 01000017 | 0000001f | 00000004 | 0003c0a0 | 0003c0a0 | 00a10018 | 00000000 |
| 0055300 | 000748fc | 01000017 | 0000001f | 00000004 | 00040120 | 00040120 | 0081001e | 00000000 | 0007491c | 01000017 | 0000001f | 00000004 |
| 0055360 | 00040fec | 00040fec | 00810022 | 00000000 | 0007493c | 01000017 | 0000002f | 00000004 | 000595c0 | 000595c0 | 00810037 | 00000000 |
| 0055440 | 0007495c | 01000017 | 0000001f | 00000004 | 0003c7d4 | 0003c7d4 | 00a10018 | 00000000 | 0007497c | 01000017 | 0000002f | 00000004 |
| 0055520 | 00058d70 | 00058dc0 | 00810037 | 00000000 | 0007499c | 01000017 | 0000001f | 00000004 | 00040f94 | 00040f94 | 00810021 | 00000000 |
| 0055600 | 000749bc | 01000017 | 0000001f | 00000004 | 00032808 | 00032808 | 00810010 | 00000000 | 000749dc | 01000017 | 00000027 | 00000004 |
| 0055660 | 00046db8 | 00046db8 | 00810029 | 00000000 | 000749fc | 01000017 | 0000001f | 00000004 | 00058340 | 0005838c | 00810035 | 00000000 |
| 0055740 | 00074a1c | 01000017 | 0000001f | 00000004 | 0002d260 | 0002d260 | 0081000c | 00000000 | 00074a3c | 01000017 | 0000001f | 00000004 |
| 0056020 | 00057aac | 00057b6c | 00810035 | 00000000 | 00074a5c | 01000017 | 0000001f | 00000004 | 00033e50 | 00033f78 | 00810011 | 00000000 |
| 0056100 | 00074a7c | 01000017 | 0000001f | 00000004 | 000526c8 | 000526c8 | 00810030 | 00000000 | 00074a9c | 01000017 | 0000001f | 00000004 |
| 0056160 | 0003c424 | 0003c424 | 00a10018 | 00000000 | 00074abc | 01000017 | 0000001f | 00000004 | 0003fb5c | 0003fb5c | 0081001e | 00000000 |
| 0056240 | 00074adc | 01000017 | 0000001f | 00000004 | 00040e6c | 00040e6c | 00810021 | 00000000 | 00074afc | 01000017 | 0000001f | 00000004 |
| 0056320 | 00040e94 | 00040e94 | 00810021 | 00000000 | 00074b1c | 01000017 | 0000001f | 00000004 | 00040e80 | 00040e80 | 00810021 | 00000000 |
| 0056400 | 00074b3c | 01000017 | 0000001f | 00000004 | 0004006c | 0004006c | 0081001e | 00000000 | 00074b5c | 01000017 | 0000001f | 00000004 |
| 0056460 | 0003faf0 | 0003faf0 | 0081001e | 00000000 | 00074b7c | 01000017 | 0000001f | 00000004 | 0003fd54 | 0003fd54 | 0081001e | 00000000 |
| 0056540 | 00074b9c | 01000017 | 0000002f | 00000004 | 00059d74 | 00059d74 | 00810037 | 00000000 | 00074bbc | 01000017 | 0000001f | 00000004 |
| 0056620 | 0004a60c | 0004a60c | 0081002b | 00000000 | 00074bdc | 01000017 | 0000001f | 00000004 | 00049a00 | 00049a58 | 0081002a | 00000000 |
| 0056700 | 00074bfc | 01000017 | 0000001f | 00000004 | 000499bc | 000499bc | 0081002a | 00000000 | 00074c1c | 01000017 | 0000001f | 00000004 |
| 0056760 | 0002c7ec | 0002c7ec | 0081000c | 00000000 | 00074c3c | 01000017 | 0000001f | 00000004 | 0003c684 | 0003c684 | 00a10018 | 00000000 |
| 0057040 | 00074c5c | 01000017 | 0000002f | 00000004 | 00058b0c | 00058b0c | 00a10036 | 00000000 | 00074c7c | 01000017 | 0000001f | 00000004 |
| 0057120 | 00059fcc | 00059fcc | 00810037 | 00000000 | 00074c9c | 01000017 | 0000001f | 00000004 | 00036600 | 00036600 | 00810012 | 00000000 |
| 0057200 | 00074cbc | 01000017 | 0000001f | 00000004 | 0002d908 | 0002d908 | 00810008 | 00000000 | 00074cdc | 01000017 | 0000001f | 00000004 |
| 0057260 | 0004ffe8 | 0004ffe8 | 00810030 | 00000000 | 00074cfc | 01000017 | 00000027 | 00000004 | 00058928 | 00058928 | 00810036 | 00000000 |
| 0057340 | 00074d1c | 01000017 | 0000001f | 00000004 | 00043a50 | 00043a50 | 00810026 | 00000000 | 00074d3c | 01000017 | 0000001f | 00000004 |
| 0057420 | 00024b3c | 00024b3c | 00810001 | 00000000 | 00074d5c | 01000017 | 0000001f | 00000004 | 00024bd8 | 00024bd8 | 00810001 | 00000000 |
| 0057500 | 00074d7c | 01000017 | 0000001f | 00000004 | 00024b90 | 00024b90 | 00810001 | 00000000 | 00074d9c | 01000017 | 0000001f | 00000004 |
| 0057560 | 00024a98 | 00024a98 | 00810001 | 00000000 | 00074dbc | 01000017 | 0000001f | 00000004 | 00024990 | 00024990 | 00810001 | 00000000 |
| 0057640 | 00074ddc | 01000017 | 0000001f | 00000004 | 00024ae0 | 00024ae0 | 00810001 | 00000000 | 00074dfc | 01000017 | 0000001f | 00000004 |

```
0057720  00024a38 00024a38 00810001 00000000 00074e1c 01000017 0000001f 00000004 0002491c 0002491c 00810001 00000000
0060000  00074e3c 01000017 0000001f 00000004 00024974 00024974 00810001 00000000 00074e5c 01000017 0000001f 00000004
0060060  000248b4 000248b4 00810001 00000000 00074e7c 01000017 0000001f 00000004 00026d98 00026d98 00810003 00000000
0060140  00074e9c 01000017 0000001f 00000004 0002c750 0002c750 0081000c 00000000 00074ebc 01000017 0000001f 00000004
0060220  0003d478 0003d4b0 0081001a 00000000 00074edc 01000017 0000001f 00000004 0003ce98 0003ce98 0081001a 00000000
0060300  00074efc 01000017 0000001f 00000004 0003c668 0003c668 00a10018 00000000 00074f1c 01000017 0000001f 00000004
0060360  00033038 00033038 00810010 00000000 00074f3c 01000017 0000001f 00000004 0003c0b8 0003c0b8 00a10018 00000000
0060440  00074f5c 01000017 0000001f 00000004 0003c76c 0003c76c 00a10018 00000000 00074f7c 01000017 0000001f 00000004
0060520  00058444 0005847c 00810035 00000000 00074f9c 01000017 0000001f 00000004 0003c128 0003c128 00a10018 00000000
0060600  00074fbc 01000017 0000001f 00000004 00049714 00049714 0081002a 00000000 00074fdc 01000017 0000001f 00000004
0060660  00044340 00044340 00810027 00000000 00074ffc 01000017 0000001f 00000004 0005849c 0005849c 00810035 00000000
0060740  0007501c 01000017 0000001f 00000004 000426a0 000426a0 00810024 00000000 0007503c 01000017 0000001f 00000004
0061020  0003c504 0003c504 00a10018 00000000 0007505c 01000017 0000001f 00000004 0002a82c 0002a864 0081000a 00000000
0061100  0007507c 01000017 0000001f 00000004 0002a804 0002a804 0081000a 00000000 0007509c 01000017 0000001f 00000004
0061160  00059ecc 00059ecc 00810038 00000000 000750bc 01000017 0000001f 00000004 00057cd8 00057cd8 00810035 00000000
0061240  000750dc 01000017 0000001f 00000004 00057c68 00057ca0 00810035 00000000 000750fc 01000017 0000001f 00000004
0061120  00026ea0 00026ea0 00810003 00000000 0007511c 01000017 0000001f 00000004 00039b90 00039b90 00810016 00000000
0061400  0007513c 01000017 00000027 00000004 00048b10 00048b10 00810029 00000000 0007515c 01000017 0000001f 00000004
0061460  00026f68 00026f68 00810003 00000000 0007517c 01000017 0000001f 00000004 0004c50c 0004c50c 00810030 00000000
0061540  0007519c 01000017 0000001f 00000004 0004c540 0004c540 00810030 00000000 000751bc 01000017 0000001f 00000004
0061620  0002799c 0002799c 00810005 00000000 000751dc 01000017 0000001f 00000004 0003c478 0003c478 00a10018 00000000
0061700  000751fc 01000017 0000001f 00000004 0004a598 0004a598 0081002b 00000000 0007521c 01000017 0000001f 00000004
0061760  0004ff70 0004ff70 00810030 00000000 0007523c 01000017 0000001f 00000004 00032e00 00032e00 00810010 00000000
0062040  0007525c 01000017 0000001f 00000004 00032ba0 00032ba0 00810010 00000000 0007527c 01000017 0000001f 00000004
0062120  0005a020 0005a020 00810039 00000000 0007529c 01000017 0000001f 00000004 000512a8 000512a8 00810030 00000000
0062200  000752bc 01000017 0000001f 00000004 000353a8 000353a8 00810012 00000000 000752dc 01000017 0000001f 00000004
0062260  00052b1c 00052b64 00810030 00000000 000752fc 01000017 0000001f 00000004 0005270c 0005270c 00810030 00000000
0062340  0007531c 01000017 0000002f 00000004 0005917c 000591a4 00810037 00000000 0007533c 01000017 0000001f 00000004
0062420  0004a664 0004a69c 0081002b 00000000 0007535c 01000017 0000001f 00000004 00052680 000526bc 00810030 00000000
0062500  0007537c 01000017 00000037 00000004 0002de2c 0002de2c 0081000d 00000000 0007539c 01000017 0000003f 00000004
0062560  00055ee0 00055ee0 00810033 00000000 000753bc 01000017 0000001f 00000004 0004e1f4 0004e298 00810030 00000000
0062640  000753dc 01000017 0000001f 00000004 000413f8 000413f8 00810023 00000000 000753fc 01000017 00000027 00000004
0062720  00048474 00048474 00810029 00000000 0007541c 01000017 00000027 00000004 0004848c 0004848c 00810029 00000000
0063000  0007543c 01000017 0000002f 00000004 00059684 00059684 00810037 00000000 0007545c 01000017 0000001f 00000004
0063060  0002a30c 0002a30c 0081000a 00000000 0007547c 01000017 0000001f 00000004 0004380c 0004380c 00a10025 00000000
0063140  0007549c 01000017 00000027 00000004 00031904 00031968 0081000f 00000000 000754bc 01000017 0000001f 00000004
0063220  00045ac0 00045af8 00810028 00000000 000754dc 01000017 0000001f 00000004 0002d1e8 0002d204 0081000c 00000000
0063300  000754fc 01000017 0000001f 00000004 00024860 000248a8 00810001 00000000 0007551c 01000017 0000001f 00000004
0063360  0004b4c8 0004b4c8 0081002f 00000000 0007553c 01000017 0000001f 00000004 0004b500 0004b500 0081002f 00000000
0063440  0007555c 01000017 0000001f 00000004 0004b538 0004b538 0081002f 00000000 0007557c 01000017 0000001f 00000004
0063520  0004b490 0004b490 0081002f 00000000 0007559c 01000017 0000001f 00000004 0004ab90 0004ab90 0081002d 00000000
0063600  000755bc 01000017 0000001f 00000004 00042580 00042580 00810024 00000000 000755dc 01000017 0000001f 00000004
0063660  00036bb4 00036bb4 00810012 00000000 000755fc 01000017 0000001f 00000004 00036b8c 00036b8c 00810012 00000000
0063740  0007561c 01000017 0000001f 00000004 00036b64 00036b64 00810012 00000000 0007563c 01000017 0000001f 00000004
0064020  00036bdc 00036bdc 00810012 00000000 0007565c 01000017 0000001f 00000004 00036b14 00036b14 00810012 00000000
0064100  0007567c 01000017 0000001f 00000004 00036b3c 00036b3c 00810012 00000000 0007569c 01000017 0000002f 00000004
0064160  00058fb0 00058fb0 00810037 00000000 000756bc 01000017 0000001f 00000004 000407c0 000407c0 00810020 00000000
0064240  000756dc 01000017 0000001f 00000004 0004076c 0004076c 00810020 00000000 000756fc 01000017 0000001f 00000004
0064320  00037798 000377c4 00810014 00000000 0007571c 01000017 00000027 00000004 00046e50 00046e50 00810029 00000000
0064400  0007573c 01000017 0000001f 00000004 0004c764 0004c764 00810030 00000000 0007575c 01000017 0000001f 00000004
0064460  00035348 00035348 00810012 00000000 0007577c 01000017 0000001f 00000004 00050278 00050278 00810030 00000000
0064540  0007579c 01000017 0000001f 00000004 0003a180 0003a180 00810017 00000000 000757bc 01000017 0000001f 00000004
0064620  00028720 00028720 00810008 00000000 000757dc 01000017 0000001f 00000004 0003a93c 0003a93c 00810017 00000000
0064700  000757fc 01000017 0000001f 00000004 0004cb20 0004cb20 00810030 00000000 0007581c 01000017 0000001f 00000004
0064760  000282f8 000282f8 00810008 00000000 0007583c 01000017 0000001f 00000004 0004c6c8 0004c6c8 00810030 00000000
```

```
0065040  0007585c 01000017 0000001f 00000004 0004ae34 0004ae34 0081002d 00000000 0007587c 01000017 0000001f 00000004
0065120  0004ef6c 0004ef6c 00810030 00000000 0007589c 01000017 0000001f 00000004 0004ef1c 0004ef1c 00810030 00000000
0065200  000758bc 01000017 0000001f 00000004 00031dac 00031dac 00810010 00000000 000758dc 01000017 0000001f 00000004
0065260  0003ba3c 0003ba3c 00810018 00000000 000758fc 01000017 00000027 00000004 00031230 00031230 0081000f 00000000
0065340  0007591c 01000017 0000001f 00000004 00040fcc 00040fdc 00810022 00000000 0007593c 01000017 0000001f 00000004
0065420  0003c784 0003c784 00a10018 00000000 0007595c 01000017 0000001f 00000004 0003fc34 0003fc34 0081001e 00000000
0065500  0007597c 01000017 0000001f 00000004 0003f994 0003faac 0081001e 00000000 0007599c 01000017 0000001f 00000004
0065560  000278f4 000278f4 00810005 00000000 000759bc 01000017 0000001f 00000004 00057d54 00057d54 00810035 00000000
0065640  000759dc 01000017 0000001f 00000004 0003b2dc 0003b2dc 00810017 00000000 000759fc 01000017 0000001f 00000004
0065720  0003b254 0003b254 00810017 00000000 00075a1c 01000017 0000001f 00000004 0004ae94 0004ae94 0081002d 00000000
0066000  00075a3c 01000017 0000001f 00000004 0003bce0 0003bce0 00810018 00000000 00075a5c 01000017 0000001f 00000004
0066060  0004b138 0004b138 0081002d 00000000 00075a7c 01000017 0000001f 00000004 0003cbbc 0003cbbc 00a10018 00000000
0066140  00075a9c 01000017 0000001f 00000004 0003c43c 0003c43c 00a10018 00000000 00075abc 01000017 0000001f 00000004
0066220  00040ea8 00040ea8 00810021 00000000 00075adc 01000017 0000001f 00000004 00040ed8 00040ed8 00810021 00000000
0066300  00075afc 01000017 0000001f 00000004 00040ec0 00040ec0 00810021 00000000 00075b1c 01000017 0000001f 00000004
0066360  0003ffd4 0003ffd4 0081001e 00000000 00075b3c 01000017 0000001f 00000004 00043e44 00043e84 00810026 00000000
0066440  00075b5c 01000017 0000001f 00000004 00040f04 00040f04 00810021 00000000 00075b7c 01000017 0000001f 00000004
0066520  000286f4 000286f4 00810003 00000000 00075b9c 01000017 00000027 00000004 000483bc 000483f4 00810029 00000000
0066600  00075bbc 01000017 00000027 00000004 00058aac 00058aac 00810036 00000000 00075bdc 01000017 0000001f 00000004
0066660  000367e0 000367e0 00810012 00000000 00075bfc 01000017 0000001f 00000004 0003bb6c 0003bb6c 00810018 00000000
0066740  00075c1c 01000017 0000001f 00000004 0003c7bc 0003c7bc 00a10018 00000000 00075c3c 01000017 0000001f 00000004
0067020  0003c7a0 0003c7a0 00a10018 00000000 00075c5c 01000017 0000001f 00000004 0003ca34 0003ca34 00a10018 00000000
0067100  00075c7c 01000017 0000001f 00000004 0003ca6c 0003ca6c 00a10018 00000000 00075c9c 01000017 0000001f 00000004
0067160  0003c8f0 0003c8f0 00a10018 00000000 00075cbc 01000017 0000001f 00000004 0004a4a4 0004a4a4 0081002b 00000000
0067240  00075cdc 01000017 0000001f 00000004 0004a30c 0004a330 0081002b 00000000 00075cfc 01000017 0000001f 00000004
0067320  0003a454 0003a4ac 00810017 00000000 00075d1c 01000017 0000001f 00000004 00033658 000336cc 00810010 00000000
0067400  00075d3c 01000017 0000001f 00000004 0003390c 0003390c 00810010 00000000 00075d5c 01000017 0000003f 00000004
0067460  00055cfc 00055cfc 00810033 00000000 00075d7c 01000017 0000001f 00000004 00035c0c 00035c58 00810012 00000000
0067540  00075d9c 01000017 0000001f 00000004 000526e8 00052700 00810030 00000000 00075dbc 01000017 0000001f 00000004
0067620  0003cf74 0003cf74 0081001a 00000000 00075ddc 01000017 0000001f 00000004 00038c80 00038cb8 00810014 00000000
0067700  00075dfc 01000017 0000001f 00000004 000496ec 000496ec 0081002a 00000000 00075e1c 01000017 0000001f 00000004
0067760  000495cc 000495cc 0081002a 00000000 00075e3c 01000017 0000001f 00000004 00041074 00041074 00810022 00000000
0070040  00075e5c 01000017 0000001f 00000004 0003b98c 0003b98c 00810018 00000000 00075e7c 01000017 0000001f 00000004
0070120  00029fe4 00029fe4 00810009 00000000 00075e9c 01000017 0000001f 00000004 00029fb0 00029fb0 00810009 00000000
0070200  00075ebc 01000017 0000001f 00000004 00029870 00029870 00810009 00000000 00075edc 01000017 0000001f 00000004
0070260  000298c4 000298c4 00810009 00000000 00075efc 01000017 0000001f 00000004 00029a68 00029a68 00810009 00000000
0070340  00075f1c 01000017 0000001f 00000004 000296a4 000296a4 00810009 00000000 00075f3c 01000017 0000001f 00000004
0070420  000298f4 000298f4 00810009 00000000 00075f5c 01000017 0000001f 00000004 00029924 00029924 00810009 00000000
0070500  00075f7c 01000017 0000001f 00000004 000295d4 000295d4 00810009 00000000 00075f9c 01000017 0000001f 00000004
0070560  00028f40 00028f40 00810009 00000000 00075fbc 01000017 0000001f 00000004 00029aa8 00029aa8 00810009 00000000
0070640  00075fdc 01000017 0000001f 00000004 00040428 00040428 0081001f 00000000 00075ffc 01000017 00000027 00000004
0070720  00047554 00047554 00810029 00000000 0007601c 01000017 00000027 00000004 00047510 00047510 00810029 00000000
0071000  0007603c 01000017 0000001f 00000004 00058030 00058068 00810035 00000000 0007605c 01000017 0000001f 00000004
0071060  0004399c 0004399c 00810026 00000000 0007607c 01000017 0000001f 00000004 00040ca8 00040cb8 00810020 00000000
0071140  0007609c 01000017 0000001f 00000004 00040d74 00040d94 00810020 00000000 000760bc 01000017 0000001f 00000004
0071220  0005a02c 0005a02c 00810039 00000000 000760dc 01000017 0000001f 00000004 0003b47c 0003b518 00810017 00000000
0071300  000760fc 01000017 0000001f 00000004 0005a038 0005a038 00810039 00000000 0007611c 01000017 0000001f 00000004
0071360  0003d2bc 0003d3e0 0081001a 00000000 0007613c 01000017 0000001f 00000004 0003d3f0 0003d3f0 0081001a 00000000
0071440  0007615c 01000017 00000027 00000004 0004732c 00047334 00810029 00000000 0007617c 01000017 00000027 00000004
0071520  00048c68 00048ca0 00810029 00000000 0007619c 01000017 0000001f 00000004 00043c84 00043d30 00810026 00000000
0071600  000761bc 01000017 0000001f 00000004 0005a008 0005a008 00810039 00000000 000761dc 01000017 0000001f 00000004
0071660  000498f0 0004999c 0081002a 00000000 000761fc 01000017 0000001f 00000004 0003e654 0003e654 0081001a 00000000
0071740  0007621c 01000017 0000001f 00000004 00025528 00025528 00810003 00000000 0007623c 01000017 0000001f 00000004
0072020  0002d03c 0002d03c 0081000c 00000000 0007625c 01000017 0000001f 00000004 0003feac 0003feac 0081001e 00000000
0072100  0007627c 01000017 00000027 00000004 00049310 000493d4 00810029 00000000 0007629c 01000017 00000027 00000004
```

```
0072160 00049290 00049290 00810029 00000000 000762bc 01000017 00000027 00000004 00046d38 00046d38 00810029 00000000
0072240 000762dc 01000017 00000027 00000004 00046cf8 00046cf8 00810029 00000000 000762fc 01000017 00000027 00000004
0072320 00046d78 00046d78 00810029 00000000 0007631c 01000017 0000001f 00000004 00027964 00027964 00810005 00000000
0072400 0007633c 01000017 0000001f 00000004 0002792c 0002792c 00810005 00000000 0007635c 01000017 0000001f 00000004
0072460 00027ce8 00027ce8 00810006 00000000 0007637c 01000017 0000001f 00000004 0003727c 000372b4 00810014 00000000
0072540 0007639c 01000017 0000001f 00000004 0003c4e8 0003c4e8 00a10018 00000000 000763bc 01000017 0000003f 00000004
0072620 00055e34 00055e34 00810033 00000000 000763dc 01000017 0000001f 00000004 0004f3c0 0004f3c0 00810030 00000000
0072700 000763fc 01000017 00000027 00000004 000306b0 000306b0 0081000f 00000000 0007641c 01000017 0000001f 00000004
0072760 00035b04 00035b50 00810012 00000000 0007643c 01000017 0000001f 00000004 0003bae0 0003bae0 00810018 00000000
0073040 0007645c 01000017 0000001f 00000004 00036158 0003621c 00810012 00000000 0007647c 01000017 0000001f 00000004
0073120 000381f0 00038204 00810014 00000000 0007649c 01000017 0000001f 00000004 00053874 00053874 00810030 00000000
0073200 000764bc 01000017 0000001f 00000004 00024c2c 00024c2c 00810001 00000000 000764dc 01000017 0000001f 00000004
0073260 0002826c 0002826c 00810008 00000000 000764fc 01000017 0000001f 00000004 000247a0 000247e0 00810001 00000000
0073340 0007651c 01000017 0000001f 00000004 000500ac 000500ac 00810030 00000000 0007653c 01000017 00000027 00000004
0073420 00058860 00058860 00810036 00000000 0007655c 01000017 0000001f 00000004 0004e1c8 0004e1dc 00810030 00000000
0073500 0007657c 01000017 0000001f 00000004 000354a0 000354a0 00810012 00000000 0007659c 01000017 00000027 00000004
0073560 00030684 00030694 0081000f 00000000 000765bc 01000017 00000027 00000004 00031700 00031720 0081000f 00000000
0073640 000765dc 01000017 0000001f 00000004 00037344 00037344 00810014 00000000 000765fc 01000017 0000001f 00000004
0073720 00038cf0 00038d1c 00810014 00000000 0007661c 01000017 0000001f 00000004 00038d98 00038dc4 00810014 00000000
0074000 0007663c 01000017 0000001f 00000004 0003e600 0003e600 0081001a 00000000 0007665c 01000017 0000002f 00000004
0074060 00059dcc 00059dcc 00810037 00000000 0007667c 01000017 0000001f 00000004 0003a814 0003a814 00810017 00000000
0074140 0007669c 01000017 00000027 00000004 00047aac 00047aac 00810029 00000000 000766bc 01000017 0000002f 00000004
0074220 00059c84 00059c84 00810037 00000000 000766dc 01000017 0000002f 00000004 00059e20 00059e20 00810037 00000000
0074300 000766fc 01000017 0000002f 00000004 00059c38 00059c5c 00810037 00000000 0007671c 01000017 0000001f 00000004
0074360 000278bc 000278bc 00810005 00000000 0007673c 01000017 0000001f 00000004 0004a9f8 0004aa9c 0081002d 00000000
0074440 0007675c 01000017 0000001f 00000004 00050724 00050724 00810030 00000000 0007677c 01000017 0000001f 00000004
0074520 000506bc 000506bc 00810030 00000000 0007679c 01000017 0000001f 00000004 00050664 00050664 00810030 00000000
0074600 000767bc 01000017 0000001f 00000004 0003c040 0003c040 00a10018 00000000 000767dc 01000017 0000001f 00000004
0074660 000445d8 000445d8 00810027 00000000 000767fc 01000017 00000027 00000004 000464a8 000464a8 00810029 00000000
0074740 0007681c 01000017 00000027 00000004 000467a0 0004685c 00810029 00000000 0007683c 01000017 0000001f 00000004
0075020 000392d0 00039308 00810014 00000000 0007685c 01000017 0000001f 00000004 0004110c 0004110c 00810023 00000000
0075100 0007687c 01000017 00000027 00000004 000588ac 000588ac 00810036 00000000 0007689c 01000017 0000001f 00000004
0075160 000247ec 000247ec 00810001 00000000 000768bc 01000017 0000001f 00000004 0004c414 0004c414 0081002f 00000000
0075240 000768dc 01000017 0000001f 00000004 0004bfe0 0004bfe0 0081002f 00000000 000768fc 01000017 0000001f 00000004
0075320 00037f60 00037f9c 00810014 00000000 0007691c 01000017 0000001f 00000004 000246e4 000246e4 00810001 00000000
0075400 0007693c 01000017 0000001f 00000004 000364c8 000364c8 00810012 00000000 0007695c 02000017 0000001f 00000008
0075460 000378cc 000378cc 00810014 00000000 0007697c 02000017 0000001f 00000008 000444cc 000444cc 00810027 00000000
0075540 0007699c 02000017 0000001f 00000008 00044b68 00044b68 00810027 00000000 000769bc 02000017 0000001f 00000008
0075620 000454cc 000454cc 00810027 00000000 000769dc 02000017 00000037 00000008 0002f4d4 0002f50c 00810004 00000000
0075700 000769fc 02000017 0000001f 00000008 0004538c 00045494 00810027 00000000 00076a1c 02000017 0000001f 00000008
0075760 00045308 00045308 00810027 00000000 00076a3c 02000017 00000027 00000008 0004913c 0004913c 00810029 00000000
0076040 00076a5c 02000017 0000001f 00000008 00034cb8 00034cb8 00810012 00000000 00076a7c 02000017 0000001f 00000008
0076120 00050890 00050890 00810030 00000000 00076a9c 02000017 0000001f 00000008 00039350 0003936c 00810014 00000000
0076200 00076abc 02000017 0000001f 00000008 0003c734 0003c734 00a10018 00000000 00076adc 02000017 0000001f 00000008
0076260 000422c8 000422c8 00810024 00000000 00076afc 02000017 0000001f 00000008 0003f494 0003f4b4 0081001c 00000000
0076340 00076b1c 02000017 0000001f 00000008 00042e04 00042e04 00810025 00000000 00076b3c 02000017 0000001f 00000008
0076420 00031cd4 00031cec 00810010 00000000 00076b5c 02000017 0000001f 00000008 0003900c 00039044 00810014 00000000
0076500 00076b7c 02000017 0000002f 00000008 000594b0 000594b0 00810037 00000000 00076b9c 02000017 0000001f 00000008
0076560 0003361c 00033640 00810010 00000000 00076bbc 02000017 0000001f 00000008 00031ca4 00031cbc 00810010 00000000
0076640 00076bdc 02000017 0000001f 00000008 00038778 00038778 00810014 00000000 00076bfc 02000017 0000001f 00000008
0076720 0003cb68 0003cb68 00a10018 00000000 00076c1c 02000017 0000001f 00000008 0002cd00 0002cd00 0081000c 00000000
0077000 00076c3c 02000017 0000001f 00000008 00054278 00054310 00810031 00000000 00076c5c 02000017 0000001f 00000008
0077060 0004387c 0004387c 00810026 00000000 00076c7c 02000017 00000027 00000008 00048128 00048128 00810029 00000000
0077140 00076c9c 02000017 0000001f 00000008 00026e84 00026e84 00810003 00000000 00076cbc 02000017 0000001f 00000008
0077220 00027048 00027048 00810003 00000000 00076cdc 02000017 0000001f 00000008 0004e850 0004e850 00810030 00000000
```

```
0077300  00076cfc 02000017 0000001f 00000008 0004e7d0 0004e7d0 00810030 00000000 00076d1c 02000017 00000027 00000008
0077360  00048d3c 00048d90 00810029 00000000 00076d3c 02000017 0000001f 00000008 0004e9bc 0004e9f8 00010030 00000000
0077440  00076d5c 02000017 0000001f 00000008 0004312c 00043160 00810025 00000000 00076d7c 02000017 0000001f 00000008
0077520  000431f4 00043258 00810025 00000000 00076d9c 02000017 0000001f 00000008 000432cc 000432cc 00810025 00000000
0077600  00076dbc 02000017 0000001f 00000008 000363ac 000364bc 00810012 00000000 00076ddc 02000017 0000001f 00000008
0077660  000458c0 0004591c 00810027 00000000 00076dfc 02000017 0000001f 00000008 0004594c 0004594c 00810027 00000000
0077740  00076e1c 02000017 0000001f 00000008 0003bfc4 0003bfc4 00a10019 00000000 00076e3c 02000017 0000001f 00000008
0100020  0003c10c 0003c10c 00a10018 00000000 00076e5c 02000017 0000001f 00000008 0003c458 0003c458 00a10018 00000000
0100100  00076e7c 02000017 0000001f 00000008 000338a8 000338a8 00810010 00000000 00076e9c 02000017 0000001f 00000008
0100160  0002fdec 0002fe8c 0081000e 00000000 00076ebc 02000017 00000037 00000008 0002f760 0002f760 0081000d 00000000
0100240  00076edc 02000017 0000001f 00000008 00049afc 00049afc 0081002a 00000000 00076efc 02000017 0000001f 00000008
0100320  0003c7ec 0003c7ec 00a10018 00000000 00076f1c 02000017 0000001f 00000008 00058284 00058284 00810035 00000000
0100400  00076f3c 02000017 0000001f 00000008 00041704 00041704 00810023 00000000 00076f5c 02000017 0000001f 00000008
0100460  000332a0 000332d8 00810010 00000000 00076f7c 02000017 0000001f 00000008 00033244 00033278 00810010 00000000
0100540  00076f9c 02000017 0000002f 00000008 00059cb4 00059cb4 00810037 00000000 00076fbc 02000017 0000001f 00000008
0100620  0003fec8 0003ff5c 0081001e 00000000 00076fdc 02000017 0000001f 00000008 00051cfc 0005343c 00810031 00000000
0100700  00076ffc 02000017 0000001f 00000008 00033a70 00033a70 00810010 00000000 0007701c 02000017 0000001f 00000008
0100760  00033a44 00033a44 00810010 00000000 0007703c 02000017 0000001f 00000008 000432dc 000432dc 00810025 00000000
0101040  0007705c 02000017 0000001f 00000008 00050ba4 00050c20 00810030 00000000 0007707c 02000017 00000027 00000008
0101120  000494c0 00049500 00810029 00000000 0007709c 02000017 00000027 00000008 00047050 00047050 00810029 00000000
0101200  000770bc 02000017 00000027 00000008 00049088 00049130 00810029 00000000 000770dc 02000017 00000027 00000008
0101260  00049028 00049028 00810029 00000000 000770fc 02000017 00000027 00000008 00047490 00047490 00810029 00000000
0101340  0007711c 02000017 0000001f 00000008 000583d0 000583d0 00810035 00000000 0007713c 02000017 0000001f 00000008
0101420  00033fb0 00034308 00810011 00000000 0007715c 02000017 00000027 00000008 00047bf8 00047bf8 00810029 00000000
0101500  0007717c 02000017 0000001f 00000008 0004bd10 0004bd10 0081002f 00000000 0007719c 02000017 0000001f 00000008
0101560  0003f594 0003f594 0081001c 00000000 000771bc 02000017 0000001f 00000008 0003fca0 0003fca0 0081001e 00000000
0101640  000771dc 02000017 0000002f 00000008 0005951c 0005951c 00810037 00000000 000771fc 02000017 0000002f 00000008
0101720  00059580 00059598 00810037 00000000 0007721c 02000017 0000002f 00000008 00058b28 00058b28 00a10036 00000000
0102000  0007723c 02000017 0000001f 00000008 0003ffa8 0003ffa8 0081001e 00000000 0007725c 02000017 0000001f 00000008
0102060  0004b114 0004b128 0081002d 00000000 0007727c 02000017 0000001f 00000008 0003c6a0 0003c6a0 00a10018 00000000
0102140  0007729c 02000017 0000001f 00000008 0003ec74 0003ecdc 0081001c 00000000 000772bc 02000017 0000001f 00000008
0102220  00037b74 00037b74 00810014 00000000 000772dc 02000017 0000001f 00000008 0003e6b4 0003e6b4 0081001a 00000000
0102300  000772fc 02000017 0000001f 00000008 000286b8 000286e8 00810008 00000000 0007731c 02000017 0000001f 00000008
0102360  0002876c 0002876c 00810008 00000000 0007733c 02000017 0000001f 00000008 00028890 00028890 00810008 00000000
0102440  0007735c 02000017 0000001f 00000008 00028818 00028818 00810008 00000000 0007737c 02000017 0000001f 00000008
0102520  000287fc 000287fc 00810008 00000000 0007739c 02000017 0000001f 00000008 00031fa0 00031fa0 00810010 00000000
0102600  000773bc 02000017 0000001f 00000008 00028790 00028790 00810008 00000000 000773dc 02000017 0000001f 00000008
0102660  0002a3e4 0002a3e4 0081000a 00000000 000773fc 02000017 0000001f 00000008 00038bd4 00038bd4 00810014 00000000
0102740  0007741c 02000017 00000027 00000008 000475e0 0004763c 00810029 00000000 0007743c 02000017 0000001f 00000008
0103020  0003a9b8 0003aa0c 00810017 00000000 0007745c 02000017 0000001f 00000008 0003a89c 0003a89c 00810017 00000000
0103100  0007747c 02000017 0000001f 00000008 0003a8e4 0003a930 00810017 00000000 0007749c 02000017 0000001f 00000008
0103160  00040c54 00040c9c 00810020 00000000 000774bc 02000017 0000001f 00000008 00040f44 00040f44 00810021 00000000
0103240  000774dc 02000017 0000001f 00000008 00059fd8 00059fd8 00810039 00000000 000774fc 02000017 0000001f 00000008
0103320  00040f6c 00040f6c 00810021 00000000 0007751c 02000017 0000001f 00000008 00040f1c 00040f1c 00810021 00000000
0103400  0007753c 02000017 0000001f 00000008 000249f4 000249f4 00810001 00000000 0007755c 02000017 00000027 00000008
0103460  000305b0 00030674 0081000f 00000000 0007757c 02000017 00000027 00000008 000589b8 000589b8 00810036 00000000
0103540  0007759c 02000017 0000001f 00000008 0003e71c 0003e72c 0081001a 00000000 000775bc 02000017 0000001f 00000008
0103620  0003cd9c 0003cd9c 0081001a 00000000 000775dc 02000017 0000001f 00000008 000411ac 000411fc 00810023 00000000
0103700  000775fc 02000017 0000001f 00000008 0004124c 0004124c 00810023 00000000 0007761c 02000017 0000001f 00000008
0103760  00041f74 00041f74 00810023 00000000 0007763c 02000017 0000001f 00000008 0003bf6c 0003bf6c 00a10018 00000000
0104040  0007765c 02000017 0000001f 00000008 0003bfa8 0003bfa8 00a10018 00000000 0007767c 02000017 0000001f 00000008
0104120  0003c408 0003c408 00a10018 00000000 0007769c 02000017 0000001f 00000008 000456e0 00045738 00810027 00000000
0104200  000776bc 02000017 0000001f 00000008 0002cd5c 0002cd5c 0081000c 00000000 000776dc 02000017 0000001f 00000008
0104260  00032724 00032724 00810010 00000000 000776fc 02000017 0000001f 00000008 0003b908 0003b930 00810018 00000000
0104340  0007771c 02000017 0000001f 00000008 0003c000 0003c000 00a10018 00000000 0007773c 02000017 0000001f 00000008
```

| | | | | | | | | | | | | |
|---|---|---|---|---|---|---|---|---|---|---|---|---|
| 0104420 | 00049764 | 00049764 | 0081002a | 00000000 | 0007775c | 02000017 | 0000001f | 00000008 | 0003f77c | 0003f77c | 0081001d | 00000000 |
| 0104500 | 0007777c | 02000017 | 0000002f | 00000008 | 00059800 | 00059800 | 00810037 | 00000000 | 0007779c | 02000017 | 0000002f | 00000008 |
| 0104560 | 000597a0 | 000597a0 | 00810037 | 00000000 | 000777bc | 02000017 | 0000001f | 00000008 | 00058 4fc | 00058510 | 00810035 | 00000000 |
| 0104640 | 000777dc | 02000017 | 00000027 | 00000008 | 00047dd4 | 00047dd4 | 00810029 | 00000000 | 000777fc | 02000017 | 0000001f | 00000008 |
| 0104720 | 0003e01c | 0003e01c | 0081001a | 00000000 | 0007781c | 02000017 | 0000001f | 00000008 | 00051aa4 | 00051aa4 | 00810030 | 00000000 |
| 0105000 | 0007783c | 02000017 | 0000001f | 00000008 | 00039d4c | 00039da8 | 00810016 | 00000000 | 0007785c | 02000017 | 0000001f | 00000008 |
| 0105060 | 00043940 | 00043990 | 00810026 | 00000000 | 0007787c | 02000017 | 0000001f | 00000008 | 0003df50 | 0003e010 | 0081001a | 00000000 |
| 0105140 | 0007789c | 02000017 | 0000001f | 00000008 | 00051cb0 | 00051cb0 | 00810030 | 00000000 | 000778bc | 02000017 | 000020b7 | 00000008 |
| 0105220 | 0005a044 | 0005a044 | 00810039 | 00000000 | 000778dc | 02000017 | 0000001f | 00000008 | 00043a9c | 00043b08 | 00810026 | 00000000 |
| 0105300 | 000778fc | 02000017 | 0000001f | 00000008 | 0003ceb8 | 0003cf24 | 0081001a | 00000000 | 0007791c | 02000017 | 0000001f | 00000008 |
| 0105360 | 0003c84c | 0003c84c | 00a10019 | 00000000 | 0007793c | 02000017 | 0000001f | 00000008 | 0003c228 | 0003c228 | 00a10018 | 00000000 |
| 0105440 | 0007795c | 02000017 | 0000001f | 00000008 | 0003c20c | 0003c20c | 00a10018 | 00000000 | 0007797c | 02000017 | 0000001f | 00000008 |
| 0105520 | 0003c490 | 0003c490 | 00a10018 | 00000000 | 0007799c | 02000017 | 0000001f | 00000008 | 0003c6f8 | 0003c6f8 | 00a10019 | 00000000 |
| 0105600 | 000779bc | 02000017 | 0000001f | 00000008 | 0003c344 | 0003c344 | 00a10018 | 00000000 | 000779dc | 02000017 | 0000001f | 00000008 |
| 0105660 | 0003c260 | 0003c260 | 00a10019 | 00000000 | 000779fc | 02000017 | 0000001f | 00000008 | 0003c244 | 0003c244 | 00a10018 | 00000000 |
| 0105740 | 00077a1c | 02000017 | 0000001f | 00000008 | 00027ff0 | 00028018 | 00810007 | 00000000 | 00077a3c | 02000017 | 0000001f | 00000008 |
| 0106020 | 00028068 | 00028114 | 00810007 | 00000000 | 00077a5c | 02000017 | 0000001f | 00000008 | 0003c714 | 0003c714 | 00a10018 | 00000000 |
| 0106100 | 00077a7c | 02000017 | 0000001f | 00000008 | 0003631c | 0003635c | 00810012 | 00000000 | 00077a9c | 02000017 | 0000001f | 00000008 |
| 0106160 | 000561cc | 000561cc | 00810034 | 00000000 | 00077abc | 02000017 | 0000001f | 00000008 | 00039ac4 | 00039ac4 | 00910016 | 00000000 |
| 0106240 | 00077adc | 02000017 | 0000001f | 00000008 | 0002cca4 | 0002cca4 | 0081000c | 00000000 | 00077afc | 02000017 | 0000001f | 00000008 |
| 0106320 | 0002cc48 | 0002cc48 | 0081000c | 00000000 | 00077b1c | 02000017 | 0000001f | 00000008 | 000580b4 | 00058110 | 00810035 | 00000000 |
| 0106400 | 00077b3c | 02000017 | 0000001f | 00000008 | 00037c48 | 00037cc8 | 00810014 | 00000000 | 00077b5c | 02000017 | 0000001f | 00000008 |
| 0106460 | 00025380 | 00025440 | 00810003 | 00000000 | 00077b7c | 02000017 | 0000001f | 00000008 | 00052208 | 00052208 | 00810030 | 00000000 |
| 0106540 | 00077b9c | 02000017 | 0000001f | 00000008 | 000439bc | 00043a44 | 00810026 | 00000000 | 00077bbc | 02000017 | 0000001f | 00000008 |
| 0106620 | 000534bc | 000534bc | 00810030 | 00000000 | 00077bdc | 02000017 | 0000001f | 00000008 | 0003ca50 | 0003ca50 | 00a10018 | 00000000 |
| 0106700 | 00077bfc | 02000017 | 0000001f | 00000008 | 0003ca88 | 0003ca89 | 00a10018 | 00000000 | 00077c1c | 02000017 | 0000001f | 00000008 |
| 0106760 | 0003c90c | 0003c90c | 00a10019 | 00000000 | 00077c3c | 02000017 | 00000027 | 00000008 | 00046fe8 | 00047044 | 00810029 | 00000000 |
| 0107040 | 00077c5c | 02000017 | 0000001f | 00000008 | 0002a324 | 0002a324 | 0081000a | 00000000 | 00077c7c | 02000017 | 0000001f | 00000008 |
| 0107120 | 00043be4 | 00043c48 | 00810026 | 00000000 | 00077c9c | 02000017 | 0000001f | 00000008 | 00043b44 | 00043ba8 | 00810026 | 00000000 |
| 0107200 | 00077cbc | 02000017 | 0000001f | 00000008 | 00038980 | 000389a8 | 00810014 | 00000000 | 00077cdc | 02000017 | 0000001f | 00000008 |
| 0107260 | 00040ad0 | 00040ad0 | 00810020 | 00000000 | 00077cfc | 02000017 | 0000001f | 00000008 | 00057b78 | 00057bb0 | 00810035 | 00000000 |
| 0107340 | 00077d1c | 02000017 | 0000001f | 00000008 | 00037814 | 00037814 | 00810014 | 00000000 | 00077d3c | 02000017 | 0000001f | 00000008 |
| 0107420 | 000355cc | 000355cc | 00810012 | 00000000 | 00077d5c | 02000017 | 0000001f | 00000008 | 00032170 | 00032170 | 00810010 | 00000000 |
| 0107500 | 00077d7c | 02000017 | 0000001f | 00000008 | 0004a0cc | 0004a114 | 0081002a | 00000000 | 00077d9c | 02000017 | 0000001f | 00000008 |
| 0107560 | 0004a008 | 0004a050 | 0081002a | 00000000 | 00077dbc | 02000017 | 0000001f | 00000008 | 0004a138 | 0004a180 | 0081002a | 00000000 |
| 0107640 | 00077ddc | 02000017 | 0000001f | 00000008 | 00038ef8 | 00038f24 | 00810014 | 00000000 | 00077dfc | 02000017 | 00000027 | 00000008 |
| 0107720 | 000318d8 | 000318f8 | 0081000f | 00000000 | 00077e1c | 02000017 | 0000001f | 00000008 | 0003c620 | 0003c620 | 00a10018 | 00000000 |
| 0110000 | 00077e3c | 02000017 | 0000001f | 00000008 | 0003a22c | 0003a23c | 00810017 | 00000000 | 00077e5c | 02000017 | 0000001f | 00000008 |
| 0110060 | 00049ad0 | 00049af0 | 0081002a | 00000000 | 00077e7c | 02000017 | 0000001f | 00000008 | 00045a04 | 00045ab4 | 00810028 | 00000000 |
| 0110140 | 00077e9c | 02000017 | 0000001f | 00000008 | 0003653c | 00036560 | 00810012 | 00000000 | 00077ebc | 02000017 | 0000001f | 00000008 |
| 0110220 | 00045d5c | 00045d5c | 00810028 | 00000000 | 00077edc | 02000017 | 0000001f | 00000008 | 0004f9e0 | 0004fa40 | 00810030 | 00000000 |
| 0110300 | 00077efc | 02000017 | 0000001f | 00000008 | 0002cb64 | 0002cb64 | 0081000c | 00000000 | 00077f1c | 02000017 | 0000001f | 00000008 |
| 0110360 | 0004aba0 | 0004abb8 | 0081002d | 00000000 | 00077f3c | 02000017 | 0000001f | 00000008 | 0004ad34 | 0004ae0c | 0081002d | 00000000 |
| 0110440 | 00077f5c | 02000017 | 0000001f | 00000008 | 000424ec | 000424ec | 00810024 | 00000000 | 00077f7c | 02000017 | 0000001f | 00000008 |
| 0110520 | 0003fba8 | 0003fc20 | 0081001e | 00000000 | 00077f9c | 02000017 | 0000001f | 00000008 | 0004b04c | 0004b0a0 | 0081002d | 00000000 |
| 0110600 | 00077fbc | 02000017 | 0000002f | 00000008 | 00058d14 | 00058d60 | 00810037 | 00000000 | 00077fdc | 02000017 | 0000001f | 00000008 |
| 0110660 | 0003a2c8 | 0003a30c | 00810017 | 00000000 | 00077ffc | 02000017 | 0000001f | 00000008 | 0003ac10 | 0003ac50 | 00810017 | 00000000 |
| 0110740 | 0007801c | 02000017 | 0000001f | 00000008 | 0002a280 | 0002a280 | 00810009 | 00000000 | 0007803c | 02000017 | 0000001f | 00000008 |
| 0111020 | 0004255c | 0004255c | 00810024 | 00000000 | 0007805c | 02000017 | 0000001f | 00000008 | 000334fc | 000334fc | 00810010 | 00000000 |
| 0111100 | 0007807c | 02000017 | 0000001f | 00000008 | 00035b68 | 00035b94 | 00810012 | 00000000 | 0007809c | 02000017 | 0000001f | 00000008 |
| 0111160 | 0003c5c4 | 0003c5c4 | 00a10018 | 00000000 | 000780bc | 02000017 | 0000001f | 00000008 | 00034bdc | 00034c54 | 00810012 | 00000000 |
| 0111240 | 000780dc | 02000017 | 0000001f | 00000008 | 00034d58 | 00034d58 | 00810012 | 00000000 | 000780fc | 02000017 | 0000001f | 00000008 |
| 0111320 | 00035c70 | 00035c70 | 00810012 | 00000000 | 0007811c | 02000017 | 0000001f | 00000008 | 00053754 | 00053754 | 00810030 | 00000000 |
| 0111400 | 0007813c | 02000017 | 0000001f | 00000008 | 0003ecec | 0003ecec | 0081001c | 00000000 | 0007815c | 02000017 | 0000001f | 00000008 |
| 0111460 | 00057bc8 | 00057c00 | 00810035 | 00000000 | 0007817c | 02000017 | 0000001f | 00000008 | 0003a0c0 | 0003a0c0 | 00810017 | 00000000 |

```
0111540  0007819c 02000017 0000001f 00000008 0003531c 00035330 00810012 00000000 000781bc 02000017 0000001f 00000008
0111620  00025590 000255b0 00810003 00000000 000781dc 02000017 00000027 00000008 00048e20 00048e60 00810029 00000000
0111700  000781fc 02000017 00000027 00000008 00048e6c 00048e6c 00810029 00000000 0007821c 02000017 00000027 00000008
0111760  00048f20 00048f20 00810029 00000000 0007823c 02000017 00000027 00000008 00048fa4 00048fa4 00810029 00000000
0112040  0007825c 02000017 0000001f 00000008 00050ed0 00050ed0 00810030 00000000 0007827c 02000017 0000001f 00000008
0112120  000277c8 000277c8 00810004 00000000 0007829c 02000017 0000001f 00000008 00036234 00036234 00810012 00000000
0112200  000782bc 02000017 0000001f 00000008 0004ab18 0004ab80 0081002d 00000000 000782dc 02000017 00000027 00000008
0112260  00048b50 00048b50 00810029 00000000 000782fc 02000017 00000027 00000008 00030950 00030950 0081000f 00000000
0112340  0007831c 02000017 0000001f 00000008 0003aa78 0003aa78 00810017 00000000 0007833c 02000017 0000001f 00000008
0112420  0003ab80 0003aba8 00810017 00000000 0007835c 02000017 0000001f 00000008 0002a048 0002a048 00810009 00000000
0112500  0007837c 02000017 0000003f 00000008 00055d5c 00055d5c 00810033 00000000 0007839c 02000017 0000003f 00000008
0112560  00055ea4 00055ea4 00810033 00000000 000783bc 02000017 0000001f 00000008 00036058 00036058 00810012 00000000
0112640  000783dc 02000017 0000001f 00000008 0004a90c 0004a90c 00a1002c 00000000 000783fc 02000017 00000027 00000008
0112720  000480a0 000480a0 00810029 00000000 0007841c 02000017 00000027 00000008 00047f6c 00047f6c 00810029 00000000
0113000  0007843c 02000017 00000027 00000008 00048070 0004808c 00810029 00000000 0007845c 02000017 00000027 00000008
0113060  00048050 00048050 00810029 00000000 0007847c 02000017 00000027 00000008 00047fa8 00047fa8 00810029 00000000
0113140  0007849c 02000017 00000027 00000008 0004801c 00048034 00810029 00000000 000784bc 02000017 0000001f 00000008
0113220  0004186c 0004186c 00810023 00000000 000784dc 02000017 0000001f 00000008 00041950 00041950 00810023 00000000
0113300  000784fc 02000017 0000003f 00000008 00055f54 00055f54 00810033 00000000 0007851c 02000017 0000003f 00000008
0113360  00055efc 00055efc 00810033 00000000 0007853c 02000017 0000001f 00000008 00054f50 00054f8c 00810032 00000000
0113440  0007855c 02000017 00000027 00000008 0005880c 0005880c 00810036 00000000 0007857c 02000017 00000027 00000008
0113520  00031804 00031818 0081000f 00000000 0007859c 02000017 0000001f 00000008 0003c600 0003c600 00a10018 00000000
0113600  000785bc 02000017 0000001f 00000008 0003cba0 0003cba0 00a10018 00000000 000785dc 02000017 0000001f 00000008
0113660  0002c824 0002c824 0081000c 00000000 000785fc 02000017 0000001f 00000008 0004bde4 0004bef8 0081002f 00000000
0113740  0007861c 02000017 0000001f 00000008 00040ef0 00040ef0 00810021 00000000 0007863c 02000017 0000002f 00000008
0114020  00058b44 00058b44 00a10036 00000000 0007865c 02000017 0000001f 00000008 0003c4ac 0003c4ac 00a10018 00000000
0114100  0007867c 02000017 0000001f 00000008 0003c3b4 0003c3b4 00a10018 00000000 0007869c 02000017 0000001f 00000008
0114160  0003ff70 0003ff70 0081001e 00000000 000786bc 02000017 00000027 00000008 00047ec8 00047ec8 00810029 00000000
0114240  000786dc 02000017 0000001f 00000008 00051b1c 00051b1c 00810030 00000000 000786fc 02000017 0000001f 00000008
0114320  00043eb0 00043eb0 00810026 00000000 0007871c 02000017 00000027 00000008 00048228 00048268 00810029 00000000
0114400  0007873c 02000017 00000027 00000008 00048288 0004830c 00810029 00000000 0007875c 02000017 00000027 00000008
0114460  0004832c 0004839c 00810029 00000000 0007877c 02000017 00000027 00000008 00048184 00048208 00810029 00000000
0114540  0007879c 02000017 0000001f 00000008 0003828c 00038298 00810014 00000000 000787bc 02000017 00000037 00000008
0114620  0002d498 0002d498 0081000d 00000000 000787dc 02000017 00000037 00000008 0002d424 0002d480 0081000d 00000000
0114700  000787fc 02000017 0000001f 00000008 0004ea18 0004ea8c 00810030 00000000 0007881c 02000017 0000001f 00000008
0114760  0004137c 000413e8 00810023 00000000 0007883c 02000017 0000001f 00000008 0003a7f8 0003a7f8 00810017 00000000
0115040  0007885c 02000017 0000001f 00000008 00050e20 00050e20 00810030 00000000 0007887c 02000017 0000001f 00000008
0115120  0003caa4 0003caa4 00a10018 00000000 0007889c 02000017 0000001f 00000008 00049e90 00049ec8 0081002a 00000000
0115200  000788bc 02000017 0000003f 00000008 000560c0 000560c0 00810033 00000000 000788dc 02000017 0000001f 00000008
0115260  0004a340 0004a340 0081002b 00000000 000788fc 02000017 0000001f 00000008 00042898 00042898 00810024 00000000
0115340  0007891c 02000017 0000001f 00000008 000354d0 000354d0 00810012 00000000 0007893c 02000017 0000001f 00000008
0115420  00036d30 00036d44 00810012 00000000 0007895c 02000017 0000001f 00000008 0003c51c 0003c51c 00a10018 00000000
0115500  0007897c 02000017 0000003f 00000008 00055ebc 00055ebc 00810033 00000000 0007899c 02000017 0000001f 00000008
0115560  0004e2a4 0004e2c0 00810030 00000000 000789bc 02000017 0000001f 00000008 00037920 00037920 00810014 00000000
0115640  000789dc 02000017 0000001f 00000008 00057f08 00057f08 00810035 00000000 000789fc 02000017 0000001f 00000008
0115720  00057e48 00057ea4 00810035 00000000 00078a1c 02000017 0000001f 00000008 0004359c 0004359c 00810025 00000000
0116000  00078a3c 02000017 0000001f 00000008 00024e0c 00024e2c 00810002 00000000 00078a5c 02000017 0000001f 00000008
0116060  0004f53c 0004f53c 00810030 00000000 00078a7c 02000017 0000001f 00000008 00024e54 00024e74 00810002 00000000
0116140  00078a9c 02000017 00000027 00000008 00046f80 00046fdc 00810029 00000000 00078abc 02000017 0000001f 00000008
0116220  0002a9e4 0002aa2c 0081000a 00000000 00078adc 02000017 0000001f 00000008 0005852c 0005852c 00810035 00000000
0116300  00078afc 02000017 0000001f 00000008 0004201c 000420c4 00810023 00000000 00078b1c 02000017 0000001f 00000008
0116360  0003823c 00038250 00810014 00000000 00078b3c 02000017 0000001f 00000008 0004a928 0004a928 00a1002c 00000000
0116440  00078b5c 02000017 0000001f 00000008 0004b30c 0004b30c 0081002f 00000000 00078b7c 02000017 0000001f 00000008
0116520  00053d4c 00053dc4 00810031 00000000 00078b9c 02000017 0000001f 00000008 0002a010 0002a010 00810009 00000000
0116600  00078bbc 02000017 0000001f 00000008 000297c0 000297c0 00810009 00000000 00078bdc 02000017 0000001f 00000008
```

| | | | | | | | | | | | | |
|---|---|---|---|---|---|---|---|---|---|---|---|---|
| 0116660 | 000299a0 | 000299a0 | 00810009 | 00000000 | 00078bfc | 02000017 | 0000001f | 00000008 | 000299c8 | 000299c8 | 00810009 | 00000000 |
| 0116740 | 00078c1c | 02000017 | 0000001f | 00000008 | 0002966c | 0002966c | 00810009 | 00000000 | 00078c3c | 02000017 | 0000001f | 00000008 |
| 0117020 | 00029b90 | 00029b90 | 00810009 | 00000000 | 00078c5c | 02000017 | 0000001f | 00000008 | 00029c20 | 00029c20 | 00810009 | 00000000 |
| 0117100 | 00078c7c | 02000017 | 0000001f | 00000008 | 00028df4 | 00028df4 | 00810009 | 00000000 | 00078c9c | 02000017 | 0000001f | 00000008 |
| 0117160 | 00028ff8 | 00028ff8 | 00810009 | 00000000 | 00078cbc | 02000017 | 0000001f | 00000008 | 00029b18 | 00029b18 | 00810009 | 00000000 |
| 0117240 | 00078cdc | 02000017 | 0000001f | 00000008 | 00029638 | 00029638 | 00810009 | 00000000 | 00078cfc | 02000017 | 0000001f | 00000008 |
| 0117320 | 00029c94 | 00029c94 | 00810009 | 00000000 | 00078d1c | 02000017 | 0000001f | 00000008 | 00029598 | 00029598 | 00810009 | 00000000 |
| 0117400 | 00078d3c | 02000017 | 0000001f | 00000008 | 00029508 | 00029508 | 00810009 | 00000000 | 00078d5c | 02000017 | 0000001f | 00000008 |
| 0117460 | 00037fa8 | 00037fa8 | 00810014 | 00000000 | 00078d7c | 02000017 | 0000001f | 00000008 | 00033cf4 | 00033cf4 | 00810011 | 00000000 |
| 0117540 | 00078d9c | 02000017 | 0000001f | 00000008 | 0003585c | 00035aec | 00810012 | 00000000 | 00078dbc | 02000017 | 0000001f | 00000008 |
| 0117620 | 0003d090 | 0003d090 | 0081001a | 00000000 | 00078ddc | 02000017 | 0000001f | 00000008 | 0003d1fc | 0003d2ac | 0081001a | 00000000 |
| 0117700 | 00078dfc | 02000017 | 0000001f | 00000008 | 0004b17c | 0004b19c | 0081002d | 00000000 | 00078e1c | 02000017 | 0000001f | 00000008 |
| 0117760 | 0005243c | 00052510 | 00810030 | 00000000 | 00078e3c | 02000017 | 0000001f | 00000008 | 00059fe4 | 00059fe4 | 00810039 | 00000000 |
| 0120040 | 00078e5c | 02000017 | 0000001f | 00000008 | 00026324 | 00026324 | 00810003 | 00000000 | 00078e7c | 02000017 | 00000027 | 00000008 |
| 0120120 | 00046878 | 000468f0 | 00810029 | 00000000 | 00078e9c | 02000017 | 00000027 | 00000008 | 000472ec | 0004731c | 00810029 | 00000000 |
| 0120200 | 00078ebc | 02000017 | 00000027 | 00000008 | 000469dc | 00046a1c | 00810029 | 00000000 | 00078edc | 02000017 | 0000001f | 00000008 |
| 0120260 | 0002cbd0 | 0002cbd0 | 0081000c | 00000000 | 00078efc | 02000017 | 00000027 | 00000008 | 0004653c | 0004653c | 00810029 | 00000000 |
| 0120340 | 00078f1c | 02000017 | 00000027 | 00000008 | 000492e8 | 000492e8 | 00810029 | 00000000 | 00078f3c | 02000017 | 0000001f | 00000008 |
| 0120420 | 00057c18 | 00057c50 | 00810035 | 00000000 | 00078f5c | 02000017 | 00000027 | 00000008 | 00046c78 | 00046c78 | 00810029 | 00000000 |
| 0120500 | 00078f7c | 02000017 | 00000027 | 00000008 | 00046cb8 | 00046cb8 | 00810029 | 00000000 | 00078f9c | 02000017 | 0000001f | 00000008 |
| 0120560 | 000284c4 | 000284c4 | 00810008 | 00000000 | 00078fbc | 02000017 | 0000001f | 00000008 | 00027d08 | 00027d4c | 00810006 | 00000000 |
| 0120640 | 00078fdc | 02000017 | 0000001f | 00000008 | 00037b0c | 00037b40 | 00810014 | 00000000 | 00078ffc | 02000017 | 0000003f | 00000008 |
| 0120720 | 000560f8 | 000560f8 | 00810033 | 00000000 | 0007901c | 02000017 | 0000001f | 00000008 | 000510fc | 000510fc | 00810030 | 00000000 |
| 0121000 | 0007903c | 02000017 | 0000001f | 00000008 | 00028358 | 00028358 | 00810008 | 00000000 | 0007905c | 02000017 | 0000001f | 00000008 |
| 0121060 | 00051894 | 000518a4 | 00810030 | 00000000 | 0007907c | 02000017 | 00000027 | 00000008 | 00058a2c | 00058a2c | 00810036 | 00000000 |
| 0121140 | 0007909c | 02000017 | 0000001f | 00000008 | 0004dfdc | 0004dfdc | 00810030 | 00000000 | 000790bc | 02000017 | 0000001f | 00000008 |
| 0121220 | 00043e08 | 00043e08 | 00810026 | 00000000 | 000790dc | 02000017 | 0000001f | 00000008 | 00050d50 | 00050d50 | 00810030 | 00000000 |
| 0121300 | 000790fc | 02000017 | 0000002f | 00000008 | 00058e8c | 00058e8c | 00810037 | 00000000 | 0007911c | 02000017 | 0000002f | 00000008 |
| 0121360 | 00058ee4 | 00058f28 | 00810037 | 00000000 | 0007913c | 02000017 | 00000037 | 00000008 | 0002f71c | 0002f71c | 0081000d | 00000000 |
| 0121440 | 0007915c | 02000017 | 0000001f | 00000008 | 00024c7c | 00024c7c | 00810001 | 00000000 | 0007917c | 02000017 | 0000001f | 00000008 |
| 0121520 | 00028284 | 00028284 | 00810008 | 00000000 | 0007919c | 02000017 | 0000001f | 00000008 | 0003bf4c | 0003bf4c | 00a10018 | 00000000 |
| 0121600 | 000791bc | 02000017 | 0000001f | 00000008 | 00038a44 | 00038a98 | 00810014 | 00000000 | 000791dc | 02000017 | 0000001f | 00000008 |
| 0121660 | 00037bcc | 00037bcc | 00810014 | 00000000 | 000791fc | 02000017 | 0000001f | 00000008 | 000382d4 | 00038308 | 00810014 | 00000000 |
| 0121740 | 0007921c | 02000017 | 0000001f | 00000008 | 0003cb2c | 0003cb2c | 00a10018 | 00000000 | 0007923c | 02000017 | 0000001f | 00000008 |
| 0122020 | 0003aaa0 | 0003aacc | 00810017 | 00000000 | 0007925c | 02000017 | 00000027 | 00000008 | 00047b5c | 00047b5c | 00810029 | 00000000 |
| 0122100 | 0007927c | 02000017 | 00000027 | 00000008 | 00047ad0 | 00047afc | 00810029 | 00000000 | 0007929c | 02000017 | 0000001f | 00000008 |
| 0122160 | 00050c2c | 00050c2c | 00810030 | 00000000 | 000792bc | 02000017 | 0000001f | 00000008 | 0003393c | 000339e4 | 00810010 | 00000000 |
| 0122240 | 000792dc | 02000017 | 0000001f | 00000008 | 0005203c | 0005203c | 00810030 | 00000000 | 000792fc | 02000017 | 0000001f | 00000008 |
| 0122320 | 0003719c | 0003719c | 00810012 | 00000000 | 0007931c | 02000017 | 0000001f | 00000008 | 0004d02c | 0004d204 | 00810030 | 00000000 |
| 0122400 | 0007933c | 02000017 | 00000027 | 00000008 | 0003050c | 0003050c | 0081000f | 00000000 | 0007935c | 02000017 | 0000001f | 00000008 |
| 0122460 | 0004a09c | 0004a0b8 | 0081002a | 00000000 | 0007937c | 02000017 | 0000001f | 00000008 | 00054ee0 | 00054ee0 | 00810032 | 00000000 |
| 0122540 | 0007939c | 02000017 | 0000001f | 00000008 | 00054ef0 | 00054f44 | 00810032 | 00000000 | 000793bc | 02000017 | 0000001f | 00000008 |
| 0122620 | 000545c4 | 000545c4 | 00810031 | 00000000 | 000793dc | 02000017 | 0000001f | 00000008 | 000395d8 | 000395d8 | 00810014 | 00000000 |
| 0122700 | 000793fc | 02000017 | 0000001f | 00000008 | 0003a5e0 | 0003a608 | 00810017 | 00000000 | 0007941c | 02000017 | 0000001f | 00000008 |
| 0122760 | 0003a6e4 | 0003a740 | 00810017 | 00000000 | 0007943c | 02000017 | 0000001f | 00000008 | 0004af08 | 0004afb8 | 0081002d | 00000000 |
| 0123040 | 0007945c | 02000017 | 0000001f | 00000008 | 0003a620 | 0003a6d4 | 00810017 | 00000000 | 0007947c | 02000017 | 0000001f | 00000008 |
| 0123120 | 00041720 | 00041720 | 00810023 | 00000000 | 0007949c | 02000017 | 0000001f | 00000008 | 000365ec | 000365ec | 00810012 | 00000000 |
| 0123200 | 000794bc | 02000017 | 0000001f | 00000008 | 0003656c | 00036580 | 00810012 | 00000000 | 000794dc | 02000017 | 0000001f | 00000008 |
| 0123260 | 00050304 | 00050304 | 00810030 | 00000000 | 000794fc | 02000017 | 0000001f | 00000008 | 000503fc | 00050450 | 00810030 | 00000000 |
| 0123340 | 0007951c | 02000017 | 0000001f | 00000008 | 000586a4 | 000587e4 | 00810035 | 00000000 | 0007953c | 02000017 | 00000027 | 00000008 |
| 0123420 | 000464d8 | 00046530 | 00810029 | 00000000 | 0007955c | 02000017 | 0000003f | 00000008 | 000559c0 | 000559c0 | 00810033 | 00000000 |
| 0123500 | 0007957c | 02000017 | 0000003f | 00000008 | 0005598c | 0005598c | 00810033 | 00000000 | 0007959c | 02000017 | 0000001f | 00000008 |
| 0123560 | 0003c868 | 0003c868 | 00a10018 | 00000000 | 000795bc | 02000017 | 0000001f | 00000008 | 0002528c | 0002528c | 00810003 | 00000000 |
| 0123640 | 000795dc | 02000017 | 0000001f | 00000008 | 00025274 | 00025274 | 00810003 | 00000000 | 000795fc | 02000017 | 0000001f | 00000008 |
| 0123720 | 00025888 | 0002592c | 00810003 | 00000000 | 0007961c | 02000017 | 0000001f | 00000008 | 0002525c | 0002525c | 00810003 | 00000000 |

```
0124000 0007963c 02000017 0000001f 00000008 00039db8 00039db8 00810016 00000000 0007965c 02000017 0000003f 00000008
0124060 00056088 00056088 00810033 00000000 0007967c 02000017 0000003f 00000008 00056018 00056018 00810033 00000000
0124140 0007969c 02000017 0000003f 00000008 00055fb8 00055fb8 00810033 00000000 000796bc 02000017 00000027 00000008
0124220 00047e78 00047e78 00810029 00000000 000796dc 02000017 0000001f 00000008 00039320 00039320 00810014 00000000
0124300 000796fc 02000017 0000001f 00000008 0005131c 0005131c 00810030 00000000 0007971c 02000017 0000001f 00000008
0124360 0003cfac 0003d008 0081001a 00000000 0007973c 02000017 0000001f 00000008 0003caf8 0003caf8 00a10018 00000000
0124440 0007975c 02000017 0000001f 00000008 000390ec 0003912c 00810014 00000000 0007977c 02000017 0000001f 00000008
0124520 0002aa38 0002aa38 0081000a 00000000 0007979c 02000017 0000001f 00000008 0004130c 00041350 00810023 00000000
0124600 000797bc 02000017 0000001f 00000008 0003cbf8 0003cbf8 00a10018 00000000 000797dc 02000017 0000001f 00000008
0124660 00037140 0003718c 00810012 00000000 000797fc 02000017 0000001f 00000008 0003f550 0003f550 0081001c 00000000
0124740 0007981c 03000017 0000001f 0000000c 00044434 00044474 00810027 00000000 0007983c 03000017 0000001f 0000000c
0125020 000445a0 000445a0 00810027 00000000 0007985c 03000017 0000001f 0000000c 00044b9c 00044b9c 00810027 00000000
0125100 0007987c 03000017 0000001f 0000000c 00045354 00045354 00810027 00000000 0007989c 03000017 00000037 0000000c
0125160 0002f588 0002f5d0 0081000d 00000000 000798bc 03000017 00000037 0000000c 0002f5f8 0002f630 0081000d 00000000
0125240 000798dc 03000017 0000001f 0000000c 00044af0 00044b30 00810027 00000000 000798fc 03000017 0000001f 0000000c
0125320 00042e44 00042e44 00810025 00000000 0007991c 03000017 0000001f 0000000c 00026c40 00026c40 00810003 00000000
0125400 0007993c 03000017 00000027 0000000c 0004917c 0004917c 00810029 00000000 0007995c 03000017 0000001f 0000000c
0125460 00051638 00051680 00810030 00000000 0007997c 03000017 0000001f 0000000c 000516ac 000516d8 00810030 00000000
0125540 0007999c 03000017 0000001f 0000000c 0004210c 00042140 00810024 00000000 000799bc 03000017 0000001f 0000000c
0125620 00058240 00058270 00810035 00000000 000799dc 03000017 0000002f 0000000c 00059384 00059384 00810037 00000000
0125700 000799fc 03000017 0000002f 0000000c 00059220 0005924c 00810037 00000000 00079a1c 03000017 0000002f 0000000c
0125760 00059474 0005948c 00810037 00000000 00079a3c 03000017 0000001f 0000000c 00026a34 00026a7c 00810003 00000000
0126040 00079a5c 03000017 0000001f 0000000c 00027118 00027118 00810003 00000000 00079a7c 03000017 0000001f 0000000c
0126120 00027168 00027168 00810003 00000000 00079a9c 03000017 0000001f 0000000c 00052b70 00052bd4 00810030 00000000
0126200 00079abc 03000017 0000001f 0000000c 0004282c 0004282c 00810024 00000000 00079adc 03000017 00000027 0000000c
0126260 00031858 000318ac 0081000f 00000000 00079afc 03000017 00000027 0000000c 0003198c 0003199c 0081000f 00000000
0126340 00079b1c 03000017 0000001f 0000000c 0003cb48 0003cb48 00a10018 00000000 00079b3c 03000017 0000001f 0000000c
0126420 0004c9e4 0004c9e4 00810030 00000000 00079b5c 03000017 0000001f 0000000c 00033adc 00033af8 00810010 00000000
0126500 00079b7c 03000017 0000001f 0000000c 0004ac90 0004acbc 0081002d 00000000 00079b9c 03000017 0000001f 0000000c
0126560 000270b8 000270b9 00810003 00000000 00079bbc 03000017 0000001f 0000000c 0004e8b4 0004e8b4 00810030 00000000
0126640 00079bdc 03000017 00000027 0000000c 00048db4 00048db4 00810029 00000000 00079bfc 03000017 0000001f 0000000c
0126720 0004cfcc 0004d014 00810030 00000000 00079c1c 03000017 0000001f 0000000c 00042364 00042364 00810024 00000000
0127000 00079c3c 03000017 0000001f 0000000c 00043280 00043280 00810025 00000000 00079c5c 03000017 0000001f 0000000c
0127060 00042c98 00042df4 00810025 00000000 00079c7c 03000017 0000001f 0000000c 0004316c 0004316c 00810025 00000000
0127140 00079c9c 03000017 0000001f 0000000c 00042f1c 000430dc 00810025 00000000 00079cbc 03000017 0000001f 0000000c
0127220 00042eb8 00042f10 00810025 00000000 00079cdc 03000017 0000001f 0000000c 0004127c 000412d8 00810023 00000000
0127300 00079cfc 03000017 0000001f 0000000c 000416ac 000416f4 00810023 00000000 00079d1c 03000017 0000001f 0000000c
0127360 0004141c 0004141c 00810023 00000000 00079d3c 03000017 0000001f 0000000c 0004177c 0004184c 00810023 00000000
0127440 00079d5c 03000017 0000001f 0000000c 0003cbd8 0003cbd8 00a10018 00000000 00079d7c 03000017 0000001f 0000000c
0127520 00053390 00053438 00810030 00000000 00079d9c 03000017 0000001f 0000000c 000360ac 00036134 00810012 00000000
0127600 00079dbc 03000017 0000001f 0000000c 00053454 0005349c 00810030 00000000 00079ddc 03000017 00000037 0000000c
0127660 0002f778 0002f7b0 0081000d 00000000 00079dfc 03000017 0000001f 0000000c 0003c9b0 0003c9b0 00a10018 00000000
0127740 00079e1c 03000017 0000001f 0000000c 0003cf44 0003cf5c 0081001a 00000000 00079e3c 03000017 0000002f 0000000c
0130020 000595e4 000595e4 00810037 00000000 00079e5c 03000017 0000001f 0000000c 0003c82c 0003c82c 00a10018 00000000
0130100 00079e7c 03000017 0000001f 0000000c 0003c80c 0003c80c 00a10018 00000000 00079e9c 03000017 0000001f 0000000c
0130160 0004bbb0 0004bbb0 0081002f 00000000 00079ebc 03000017 0000001f 0000000c 000406cc 00040760 00810020 00000000
0130240 00079edc 03000017 0000001f 0000000c 00028550 00028550 00810008 00000000 00079efc 03000017 0000001f 0000000c
0130320 000284d4 000284d4 00810003 00000000 00079f1c 03000017 0000001f 0000000c 000537e0 000537e0 00810030 00000000
0130400 00079f3c 03000017 0000001f 0000000c 00058298 00058298 00810035 00000000 00079f5c 03000017 0000001f 0000000c
0130460 00031d64 00031d90 00810010 00000000 00079f7c 03000017 0000001f 0000000c 00033300 00033300 00810010 00000000
0130540 00079f9c 03000017 0000001f 0000000c 0003255c 0003255c 00810010 00000000 00079fbc 03000017 0000001f 0000000c
0130620 00055234 000555b8 00810032 00000000 00079fdc 03000017 0000001f 0000000c 000551c8 000551c8 00810032 00000000
0130700 00079ffc 03000017 0000001f 0000000c 00055210 00055210 00810032 00000000 0007a01c 03000017 0000001f 0000000c
0130760 00055090 00055090 00810032 00000000 0007a03c 03000017 00000027 0000000c 00048548 00048570 00810029 00000000
0131040 0007a05c 03000017 00000027 0000000c 00048740 00048740 00810029 00000000 0007a07c 03000017 00000027 0000000c
```

```
0131120  0004861c 00048670 00810029 00000000 0007a09c 03000017 0000001f 0000000c 0002596c 000259b4 00810003 00000000
0131200  0007a0bc 03000017 0000001f 0000000c 00054e68 00054e68 00810032 00000000 0007a0dc 03000017 0000001f 0000000c
0131260  0003d024 0003d024 0081001a 00000000 0007a0fc 03000017 0000001f 0000000c 00034318 0003449c 00810011 00000000
0131340  0007a11c 03000017 0000001f 0000000c 0003ca10 0003ca10 00a10018 00000000 0007a13c 03000017 0000001f 0000000c
0131420  0002c4d8 0002c518 0081000c 00000000 0007a15c 03000017 0000001f 0000000c 0003e78c 0003e78c 0081001b 00000000
0131500  0007a17c 03000017 0000001f 0000000c 00052288 00052288 00810030 00000000 0007a19c 03000017 0000001f 0000000c
0131560  0004e11c 0004e1bc 00810030 00000000 0007a1bc 03000017 0000001f 0000000c 0003e6c4 0003e6c4 0081001a 00000000
0131640  0007a1dc 03000017 0000001f 0000000c 00051358 00051358 00810030 00000000 0007a1fc 03000017 0000001f 0000000c
0131720  00026628 00026628 00810003 00000000 0007a21c 03000017 0000001f 0000000c 000260e0 000260e0 00810003 00000000
0132000  0007a23c 03000017 0000001f 0000000c 000337b4 000337e0 00810010 00000000 0007a25c 03000017 0000001f 0000000c
0132060  0003c328 0003c328 00a10018 00000000 0007a27c 03000017 0000001f 0000000c 000288c4 000288c4 00810008 00000000
0132140  0007a29c 03000017 0000001f 0000000c 00028850 00028850 00810008 00000000 0007a2bc 03000017 0000001f 0000000c
0132220  00028630 00028630 00810008 00000000 0007a2dc 03000017 0000001f 0000000c 00045b1c 00045b68 00810028 00000000
0132300  0007a2fc 03000017 0000001f 0000000c 0003f010 0003f010 0081001c 00000000 0007a31c 03000017 0000001f 0000000c
0132360  0003eed4 0003eed4 0081001c 00000000 0007a33c 03000017 0000001f 0000000c 00051918 00051964 00810030 00000000
0132440  0007a35c 03000017 0000001f 0000000c 00054c64 00054c64 00810031 00000000 0007a37c 03000017 0000001f 0000000c
0132520  00041f98 00041ff4 00810023 00000000 0007a39c 03000017 0000001f 0000000c 0003dd84 0003de44 0081001a 00000000
0132600  0007a3bc 03000017 0000001f 0000000c 0003dcec 0003dd68 0081001a 00000000 0007a3dc 03000017 0000001f 0000000c
0132660  0002c56c 0002c598 0081000c 00000000 0007a3fc 03000017 0000001f 0000000c 00026150 00026150 00810003 00000000
0132740  0007a41c 03000017 0000001f 0000000c 00042608 00042678 00810024 00000000 0007a43c 03000017 0000001f 0000000c
0133020  0003c3ec 0003c3ec 00a10018 00000000 0007a45c 03000017 0000001f 0000000c 00057dc0 00057e1c 00810035 00000000
0133100  0007a47c 03000017 0000001f 0000000c 000272b4 000272b4 00810004 00000000 0007a49c 03000017 0000001f 0000000c
0133160  0002725c 0002725c 00810004 00000000 0007a4bc 03000017 0000001f 0000000c 000389cc 000389cc 00810014 00000000
0133240  0007a4dc 03000017 0000001f 0000000c 00038f38 00038fc8 00810014 00000000 0007a4fc 03000017 0000001f 0000000c
0133320  00052184 000521f8 00810030 00000000 0007a51c 03000017 0000001f 0000000c 00044370 00044370 00810027 00000000
0133400  0007a53c 03000017 0000001f 0000000c 0002a6dc 0002a7b0 0081000a 00000000 0007a55c 03000017 0000001f 0000000c
0133460  00042728 00042798 00810024 00000000 0007a57c 03000017 0000001f 0000000c 0003d514 0003d514 0081001a 00000000
0133540  0007a59c 03000017 0000001f 0000000c 0003d4ec 0003d4ec 0081001a 00000000 0007a5bc 03000017 0000001f 0000000c
0133620  00037600 0003761c 00810014 00000000 0007a5dc 03000017 0000001f 0000000c 0003d590 0003d590 0081001a 00000000
0133700  0007a5fc 03000017 0000001f 0000000c 000335d0 00033610 00810010 00000000 0007a61c 03000017 0000001f 0000000c
0133760  00054b74 00054b74 00810031 00000000 0007a63c 03000017 0000001f 0000000c 0003c308 0003c308 00a10018 00000000
0134040  0007a65c 03000017 0000001f 0000000c 0003c2e8 0003c2e8 00a10018 00000000 0007a67c 03000017 0000001f 0000000c
0134120  00055770 000557e4 00810032 00000000 0007a69c 03000017 0000001f 0000000c 00055614 00055614 00810032 00000000
0134200  0007a6bc 03000017 0000001f 0000000c 000515c8 0005162c 00810030 00000000 0007a6dc 03000017 0000001f 0000000c
0134260  00051bec 00051ca0 00810030 00000000 0007a6fc 03000017 0000001f 0000000c 0003c2c8 0003c2c8 00a10018 00000000
0134340  0007a71c 03000017 0000001f 0000000c 0003c950 0003c950 00a10018 00000000 0007a73c 03000017 0000002f 0000000c
0134420  00058b64 00058b64 00a10036 00000000 0007a75c 03000017 0000001f 0000000c 0003c6d4 0003c6d4 00a10018 00000000
0134500  0007a77c 03000017 0000001f 0000000c 00033158 00033158 00810010 00000000 0007a79c 03000017 0000001f 0000000c
0134560  00032278 00032278 00810010 00000000 0007a7bc 03000017 0000001f 0000000c 00058128 00058128 00810035 00000000
0134640  0007a7dc 03000017 0000001f 0000000c 00039e84 00039e34 00810016 00000000 0007a7fc 03000017 0000001f 0000000c
0134720  00055808 00055938 00810032 00000000 0007a81c 03000017 0000001f 0000000c 00031b90 00031b90 00810010 00000000
0135000  0007a83c 03000017 0000001f 0000000c 0003c1e8 0003c1e8 00a10018 00000000 0007a85c 03000017 0000001f 0000000c
0135060  000551e4 000551e4 00810032 00000000 0007a87c 03000017 0000001f 0000000c 00033b48 00033b48 00810011 00000000
0135140  0007a89c 03000017 0000001f 0000000c 000508ec 00050904 00810030 00000000 0007a8bc 03000017 0000001f 0000000c
0135220  0002560c 0002562c 00810003 00000000 0007a8dc 03000017 0000001f 0000000c 00037e18 00037e50 00810014 00000000
0135300  0007a8fc 03000017 0000001f 0000000c 00025450 00025518 00810003 00000000 0007a91c 03000017 0000001f 0000000c
0135360  0003cac0 0003cac0 00a10018 00000000 0007a93c 03000017 0000001f 0000000c 0002a368 0002a368 0081000a 00000000
0135440  0007a95c 03000017 0000001f 0000000c 0002a340 0002a340 0081000a 00000000 0007a97c 03000017 0000001f 0000000c
0135520  0003abc0 0003abc0 00810017 00000000 0007a99c 03000017 0000001f 0000000c 0004fc50 0004fc9c 00810030 00000000
0135600  0007a9bc 03000017 0000001f 0000000c 000259f0 00025b38 00810003 00000000 0007a9dc 03000017 0000001f 0000000c
0135660  00039380 000393c4 00810014 00000000 0007a9fc 03000017 0000001f 0000000c 00052908 00052a1c 00810030 00000000
0135740  0007aa1c 03000017 0000001f 0000000c 0005105c 000510e0 00810030 00000000 0007aa3c 03000017 0000001f 0000000c
0136020  000274a4 000274ec 00810004 00000000 0007aa5c 03000017 0000001f 0000000c 00038dd0 00038e4c 00810014 00000000
0136100  0007aa7c 03000017 00000027 0000000c 00048698 000486d0 00810029 00000000 0007aa9c 03000017 0000001f 0000000c
0136160  00050144 000501a8 00810030 00000000 0007aabc 03000017 0000001f 0000000c 0002a5f0 0002a6c8 0081000a 00000000
```

```
0136240  0007aadc 03000017 0000001f 0000000c 0004abdc 0004ac54 0081002d 00000000 0007aafc 03000017 0000001f 0000000c
0136320  0004dbb0 0004dbb0 00810030 00000000 0007ab1c 03000017 0000001f 0000000c 0003ebc8 0003ebc8 0081001c 00000000
0136400  0007ab3c 03000017 0000001f 0000000c 0004b0ac 0004b0f8 0081002d 00000000 0007ab5c 03000017 0000001f 0000000c
0136460  0003ea44 0003ea9c 0081001c 00000000 0007ab7c 03000017 00000037 0000000c 0002e5a0 0002e5a0 0081000d 00000000
0136540  0007ab9c 03000017 0000001f 0000000c 00057700 00057718 00810035 00000000 0007abbc 03000017 0000001f 0000000c
0136620  0004725c 00042294 00810024 00000000 0007abdc 03000017 0000001f 0000000c 00054e4c 00054e4c 00810032 00000000
0136700  0007abfc 03000017 0000002f 0000000c 00058f34 00058f34 00810037 00000000 0007ac1c 03000017 0000001f 0000000c
0136760  00034ab8 00034ab8 00810012 00000000 0007ac3c 03000017 0000001f 0000000c 000355dc 0003566c 00810012 00000000
0137040  0007ac5c 03000017 0000001f 0000000c 000356a0 00035840 00810012 00000000 0007ac7c 03000017 0000001f 0000000c
0137120  0003eda4 0003eda4 0081001c 00000000 0007ac9c 03000017 0000001f 0000000c 0003ed44 0003ed44 0081001c 00000000
0137200  0007acbc 03000017 0000001f 0000000c 0003a0d8 0003a0d8 00810017 00000000 0007acdc 03000017 0000001f 0000000c
0137260  000255cc 00025600 00810003 00000000 0007acfc 03000017 0000001f 0000000c 00051a40 00051a98 00810030 00000000
0137340  0007ad1c 03000017 0000001f 0000000c 000276fc 00027744 00810004 00000000 0007ad3c 03000017 0000001f 0000000c
0137420  00026ca8 00026ca8 00810003 00000000 0007ad5c 03000017 0000001f 0000000c 00054fd0 00054fd0 00810032 00000000
0137500  0007ad7c 03000017 0000001f 0000000c 000330dc 000330dc 00810010 00000000 0007ad9c 03000017 0000003f 0000000c
0137560  00055b2c 00055b2c 00810033 00000000 0007adbc 03000017 0000001f 0000000c 000321f4 000321f4 00810010 00000000
0137640  0007addc 03000017 0000001f 0000000c 000520ec 000520ec 00810030 00000000 0007adfc 03000017 00000027 0000000c
0137720  000480c4 000480c4 00810023 00000000 0007ae1c 03000017 0000001f 0000000c 000501b4 00050250 00810030 00000000
0140000  0007ae3c 03000017 0000001f 0000000c 00042308 00042350 00810024 00000000 0007ae5c 03000017 0000001f 0000000c
0140060  00039610 00039660 00810014 00000000 0007ae7c 03000017 0000001f 0000000c 0004fcc4 0004fd2c 00810030 00000000
0140140  0007ae9c 03000017 0000001f 0000000c 00037734 00037734 00810014 00000000 0007aebc 03000017 0000001f 0000000c
0140220  00053b68 00053bfc 00810031 00000000 0007aedc 03000017 0000001f 0000000c 0005184c 00051860 00810030 00000000
0140300  0007aefc 03000017 0000001f 0000000c 0003c37c 0003c37c 00a10018 00000000 0007af1c 03000017 0000001f 0000000c
0140360  0002a390 0002a390 0081000a 00000000 0007af3c 03000017 0000001f 0000000c 00051b2c 00051b2c 00810030 00000000
0140440  0007af5c 03000017 0000001f 0000000c 000527d0 0005287c 00810030 00000000 0007af7c 03000017 0000001f 0000000c
0140520  0003c140 0003c140 00a10018 00000000 0007af9c 03000017 0000001f 0000000c 00041dd4 00041e78 00810023 00000000
0140600  0007afbc 03000017 0000001f 0000000c 00041e88 00041ee0 00810023 00000000 0007afdc 03000017 0000001f 0000000c
0140660  00041d1c 00041dc0 00810023 00000000 0007affc 03000017 0000001f 0000000c 00041cb4 00041d0c 00810023 00000000
0140740  0007b01c 03000017 0000001f 0000000c 00036f04 00036f04 00810012 00000000 0007b03c 03000017 0000001f 0000000c
0141020  00036e10 00036ec0 00810012 00000000 0007b05c 03000017 0000001f 0000000c 00053f28 00053f8c 00810031 00000000
0141100  0007b07c 03000017 0000001f 0000000c 000518b4 000518b4 00810030 00000000 0007b09c 03000017 00000037 0000000c
0141160  0002f248 0002f288 0081000d 00000000 0007b0bc 03000017 0000003f 0000000c 00055cb8 00055cb8 00810033 00000000
0141240  0007b0dc 03000017 0000003f 0000000c 00055c6c 00055c6c 00810033 00000000 0007b0fc 03000017 0000001f 0000000c
0141320  00035530 00035530 00810012 00000000 0007b11c 03000017 0000001f 0000000c 00025330 0002536c 00810003 00000000
0141400  0007b13c 03000017 00000027 0000000c 000462ec 000462ec 00810029 00000000 0007b15c 03000017 00000027 0000000c
0141460  00046378 00046378 00810029 00000000 0007b17c 03000017 0000001f 0000000c 0003bfe0 0003bfe0 00a10018 00000000
0141540  0007b19c 03000017 0000003f 0000000c 00055db8 00055db8 00810033 00000000 0007b1bc 03000017 0000001f 0000000c
0141620  0003d4c0 0003d4d4 0081001a 00000000 0007b1dc 03000017 0000001f 0000000c 00059ff0 00059ff0 00810039 00000000
0141700  0007b1fc 03000017 0000001f 0000000c 0004f2cc 0004f3a8 00810030 00000000 0007b21c 03000017 0000001f 0000000c
0141760  0004f40c 0004f40c 00810030 00000000 0007b23c 03000017 0000001f 0000000c 0002aacc 0002aacc 0081000b 00000000
0142040  0007b25c 03000017 0000001f 0000000c 0002a40c 0002a40c 0081000a 00000000 0007b27c 03000017 0000001f 0000000c
0142120  0003838c 000383b0 00810014 00000000 0007b29c 03000017 0000001f 0000000c 000438f0 00043934 00810026 00000000
0142200  0007b2bc 03000017 0000001f 0000000c 00029dbc 00029dbc 00810009 00000000 0007b2dc 03000017 0000001f 0000000c
0142260  00029f60 00029f60 00810009 00000000 0007b2fc 03000017 0000001f 0000000c 00029944 00029944 00810009 00000000
0142340  0007b31c 03000017 0000001f 0000000c 00029ebc 00029ebc 00810009 00000000 0007b33c 03000017 0000001f 0000000c
0142420  00029b50 00029b50 00810009 00000000 0007b35c 03000017 0000001f 0000000c 00029e6c 00029e6c 00810009 00000000
0142500  0007b37c 03000017 0000001f 0000000c 00028d90 00028d90 00810009 00000000 0007b39c 03000017 0000001f 0000000c
0142560  00028ca4 00028ca4 00810009 00000000 0007b3bc 03000017 0000001f 0000000c 00029218 00029218 00810009 00000000
0142640  0007b3dc 03000017 0000001f 0000000c 000291c4 000291c4 00810009 00000000 0007b3fc 03000017 0000001f 0000000c
0142720  00029260 00029260 00810009 00000000 0007b41c 03000017 0000001f 0000000c 00029540 00029540 00810009 00000000
0143000  0007b43c 03000017 0000001f 0000000c 00028990 00028990 00810009 00000000 0007b45c 03000017 0000001f 0000000c
0143060  00029430 00029430 00810009 00000000 0007b47c 03000017 0000001f 0000000c 00029334 00029334 00810009 00000000
0143140  0007b49c 03000017 0000001f 0000000c 00038004 00038004 00810014 00000000 0007b4bc 03000017 0000001f 0000000c
0143220  00033d4c 00033df8 00810011 00000000 0007b4dc 03000017 0000001f 0000000c 000381a0 000381e0 00810014 00000000
0143300  0007b4fc 03000017 0000001f 0000000c 0002a8d4 0002a9d4 0081000a 00000000 0007b51c 03000017 0000001f 0000000c
```

```
0143360  0003d0c8 0003d194 0081001a 00000000 0007b53c 03000017 00000027 0000000c 00048bbc 00048bbc 00810029 00000000
0143440  0007b55c 03000017 0000001f 0000000c 00052888 000528f4 00810030 00000000 0007b57c 03000017 0000001f 0000000c
0143520  0003c0e8 0003c0e8 00a10018 00000000 0007b59c 03000017 0000001f 0000000c 00050da8 00050e0c 00810030 00000000
0143600  0007b5bc 03000017 0000001f 0000000c 00036804 000368dc 00810012 00000000 0007b5dc 03000017 0000001f 0000000c
0143660  00057a50 00057a98 00810035 00000000 0007b5fc 03000017 00000027 0000000c 00046944 000469c8 00810029 00000000
0143740  0007b61c 03000017 00000027 0000000c 00047288 000472e0 00810029 00000000 0007b63c 03000017 00000027 0000000c
0144020  000471e8 0004727c 00810029 00000000 0007b65c 03000017 00000027 0000000c 00046c38 00046c38 00810029 00000000
0144100  0007b67c 03000017 00000037 0000000c 0002f6ac 0002f6f4 0081000d 00000000 0007b69c 03000017 00000027 0000000c
0144160  000317cc 000317f8 0081000f 00000000 0007b6bc 03000017 0000001f 0000000c 00027da0 00027dc8 00810006 00000000
0144240  0007b6dc 03000017 0000001f 0000000c 00032ec4 00032f84 00810010 00000000 0007b6fc 03000017 0000001f 0000000c
0144320  00029cc8 00029cc8 00810009 00000000 0007b71c 03000017 0000001f 0000000c 0004dff4 0004dff4 00810030 00000000
0144400  0007b73c 03000017 0000003f 0000000c 00055acc 00055b04 00810033 00000000 0007b75c 03000017 0000003f 0000000c
0144460  0005613c 0005613c 00810033 00000000 0007b77c 03000017 00000037 0000000c 0002d36c 0002d36c 00a1000c 00000000
0144540  0007b79c 03000017 0000001f 0000000c 00025654 000256c4 00810003 00000000 0007b7bc 03000017 0000001f 0000000c
0144620  0005356c 0005356c 00810030 00000000 0007b7dc 03000017 0000001f 0000000c 0003f070 0003f070 0081001c 00000000
0144700  0007b7fc 03000017 0000001f 0000000c 00027c7c 00027cc0 00810006 00000000 0007b81c 03000017 0000001f 0000000c
0144760  00027a9c 00027a9c 00810006 00000000 0007b83c 03000017 0000001f 0000000c 00050f80 00050f80 00810030 00000000
0145040  0007b85c 03000017 0000001f 0000000c 00053a0c 00053a0c 00810031 00000000 0007b87c 03000017 0000001f 0000000c
0145120  00054f98 00054f98 00810032 00000000 0007b89c 03000017 0000001f 0000000c 00037abc 00037af8 00810014 00000000
0145200  0007b8bc 03000017 0000001f 0000000c 000509b4 00050a00 00810030 00000000 0007b8dc 03000017 0000001f 0000000c
0145260  00024d1c 00024d1c 00810001 00000000 0007b8fc 03000017 0000001f 0000000c 00024d60 00024d60 00810001 00000000
0145340  0007b91c 03000017 0000001f 0000000c 0003c020 0003c020 00a10018 00000000 0007b93c 03000017 0000001f 0000000c
0145420  00025c14 00025c14 00810003 00000000 0007b95c 03000017 0000001f 0000000c 000517dc 00051840 00810030 00000000
0145500  0007b97c 03000017 0000001f 0000000c 00038e58 00038e58 00810014 00000000 0007b99c 03000017 0000002f 0000000c
0145560  00058fc8 00058fc8 00810037 00000000 0007b9bc 03000017 0000001f 0000000c 000377e0 00037808 00810014 00000000
0145640  0007b9dc 03000017 0000001f 0000000c 0003b550 0003b550 00810017 00000000 0007b9fc 03000017 0000001f 0000000c
0145720  00038514 00038514 00810014 00000000 0007ba1c 03000017 0000001f 0000000c 00038d28 00038d60 00810014 00000000
0146000  0007ba3c 03000017 0000001f 0000000c 0003ab04 0003ab04 00810017 00000000 0007ba5c 03000017 0000001f 0000000c
0146060  0003aa18 0003aa18 00810017 00000000 0007ba7c 03000017 0000001f 0000000c 0003a834 0003a978 00810017 00000000
0146140  0007ba9c 03000017 00000027 0000000c 00047b9c 00047b9c 00810029 00000000 0007babc 03000017 0000001f 0000000c
0146220  00057fdc 0005800c 00810035 00000000 0007badc 03000017 0000001f 0000000c 0003c8d0 0003c8d0 00a10018 00000000
0146300  0007bafc 03000017 0000002f 0000000c 00059760 00059760 00810037 00000000 0007bb1c 03000017 0000002f 0000000c
0146360  000596e4 000596e4 00810037 00000000 0007bb3c 03000017 0000001f 0000000c 0005234c 0005234c 00810030 00000000
0146440  0007bb5c 03000017 0000001f 0000000c 0004fd38 0004fd38 00810030 00000000 0007bb7c 03000017 0000001f 0000000c
0146520  0004a8ec 0004a8ec 00a1002c 00000000 0007bb9c 03000017 0000001f 0000000c 000347a8 000347a8 00810011 00000000
0146600  0007bbbc 03000017 0000001f 0000000c 000346cc 00034720 00810011 00000000 0007bbdc 03000017 0000001f 0000000c
0146660  00050460 00050554 00810030 00000000 0007bbfc 03000017 0000001f 0000000c 0005060c 0005060c 00810030 00000000
0146740  0007bc1c 03000017 0000001f 0000000c 0005032c 000503ec 00810030 00000000 0007bc3c 03000017 0000001f 0000000c
0147020  000252a4 000252a4 00810003 00000000 0007bc5c 03000017 0000001f 0000000c 000256dc 00025774 00810003 00000000
0147100  0007bc7c 03000017 0000001f 0000000c 00039488 00039498 00810014 00000000 0007bc9c 03000017 0000001f 0000000c
0147160  00030284 000302d0 0081000e 00000000 0007bcbc 03000017 0000001f 0000000c 00028444 000284a4 00810008 00000000
0147240  0007bcdc 03000017 0000001f 0000000c 0003f1a8 0003f1bc 0081001c 00000000 0007bcfc 03000017 0000001f 0000000c
0147320  00041ef4 00041f54 00810023 00000000 0007bd1c 03000017 0000001f 0000000c 0005117c 0005129c 00810030 00000000
0147400  0007bd3c 03000017 0000001f 0000000c 0003034c 00030384 0081000e 00000000 0007bd5c 03000017 00000027 0000000c
0147460  000473b4 000473fc 00810029 00000000 0007bd7c 03000017 0000001f 0000000c 0004383c 0004383c 00810026 00000000
0147540  0007bd9c 03000017 0000001f 0000000c 00037ce8 00037ce8 00810014 00000000 0007bdbc 03000017 0000001f 0000000c
0147620  00037d44 00037d90 00810014 00000000 0007bddc 03000017 0000001f 0000000c 00043828 00043828 00810026 00000000
0147700  0007bdfc 03000017 0000001f 0000000c 000362b0 000362b0 00810012 00000000 0007be1c 03000017 0000001f 0000000c
0147760  000339f4 00033a38 00810010 00000000 0007be3c 04000017 0000001f 00000010 000444f8 0004453c 00810027 00000000
0150040  0007be5c 04000017 00000037 00000010 0002e710 0002e710 0081000d 00000000 0007be7c 04000017 00000037 00000010
0150120  0002ec04 0002ec04 0081000d 00000000 0007be9c 04000017 0000001f 00000010 00045654 00045654 00810027 00000000
0150200  0007bebc 04000017 0000001f 00000010 00044654 0004498c 00810027 00000000 0007bedc 04000017 0000001f 00000010
0150260  000449b8 00044ac0 00810027 00000000 0007befc 04000017 0000001f 00000010 00024518 00024580 00810001 00000000
0150340  0007bf1c 04000017 0000001f 00000010 00024408 000244fc 00810001 00000000 0007bf3c 04000017 0000001f 00000010
0150420  000421b8 00042208 00810024 00000000 0007bf5c 04000017 0000001f 00000010 00042154 000421a0 00810024 00000000
```

```
0150500  0007bf7c 04000017 0000001f 00000010 0003b940 0003b968 00810018 00000000 0007bf9c 04000017 0000001f 00000010
0150560  00026bbc 00026c1c 00810003 00000000 0007bfbc 04000017 0000001f 00000010 00037d9c 00037dfc 00810014 00000000
0150640  0007bfdc 04000017 0000002f 00000010 00059270 000592a8 00810037 00000000 0007bffc 04000017 0000002f 00000010
0150720  000592ec 000592ec 00810037 00000000 0007c01c 04000017 0000001f 00000010 000387b0 000387b0 00810014 00000000
0151000  0007c03c 04000017 0000001f 00000010 0003867c 000386f0 00810014 00000000 0007c05c 04000017 0000001f 00000010
0151060  0004c7b0 0004c7b0 00810030 00000000 0007c07c 04000017 00000027 00000010 00046a2c 00046b00 00810029 00000000
0151140  0007c09c 04000017 0000001f 00000010 0004eb4c 0004eed4 00810030 00000000 0007c0bc 04000017 0000001f 00000010
0151220  0004e478 0004e69c 00810030 00000000 0007c0dc 04000017 0000001f 00000010 000431bc 000431e8 00810025 00000000
0151300  0007c0fc 04000017 00000027 00000010 00046b14 00046b14 00810029 00000000 0007c11c 04000017 0000001f 00000010
0151360  0003a144 0003a154 00810017 00000000 0007c13c 04000017 0000001f 00000010 0003c990 0003c990 00a10018 00000000
0151440  0007c15c 04000017 0000001f 00000010 0003d6dc 0003d6dc 0081001a 00000000 0007c17c 04000017 0000001f 00000010
0151520  0003a40c 0003a424 00810017 00000000 0007c19c 04000017 0000001f 00000010 0004bbf4 0004bc8c 0081002f 00000000
0151600  0007c1bc 04000017 0000001f 00000010 0004090c 00040924 00810020 00000000 0007c1dc 04000017 0000001f 00000010
0151660  00028600 00028600 00810008 00000000 0007c1fc 04000017 0000001f 00000010 0003c538 0003c53a 00a10018 00000000
0151740  0007c21c 04000017 0000001f 00000010 0003c560 0003c560 00a10018 00000000 0007c23c 04000017 0000001f 00000010
0152020  000551a8 000551a8 00a10031 00000000 0007c25c 04000017 0000001f 00000010 00053dd4 00053dd4 00810031 00000000
0152100  0007c27c 04000017 00000027 00000010 000486e8 00048730 00810029 00000000 0007c29c 04000017 0000001f 00000010
0152160  000395a8 000395c8 00810014 00000000 0007c2bc 04000017 0000001f 00000010 0002a1f0 0002a1f0 00810009 00000000
0152240  0007c2dc 04000017 0000001f 00000010 0002a0d4 0002a0d4 00810009 00000000 0007c2fc 04000017 0000001f 00000010
0152320  0002a148 0002a148 00810009 00000000 0007c31c 04000017 0000001f 00000010 00050a18 00050a18 00810030 00000000
0152400  0007c33c 04000017 0000001f 00000010 000353d4 00035494 00810012 00000000 0007c35c 04000017 0000001f 00000010
0152460  0003954c 00039598 00810014 00000000 0007c37c 04000017 0000001f 00000010 000585e4 00058628 00810035 00000000
0152540  0007c39c 04000017 0000001f 00000010 00058590 00058590 00810035 00000000 0007c3bc 04000017 00000027 00000010
0152620  00046bdc 00046bdc 00810029 00000000 0007c3dc 04000017 0000001f 00000010 00033714 0003379c 00810010 00000000
0152700  0007c3fc 04000017 0000001f 00000010 000265b4 000265b4 00810003 00000000 0007c41c 04000017 0000001f 00000010
0152760  00033088 00033088 00810010 00000000 0007c43c 04000017 0000002f 00000010 00058ff8 00058ff8 00810037 00000000
0153040  0007c45c 04000017 0000001f 00000010 00038bec 00038c14 00810014 00000000 0007c47c 04000017 0000001f 00000010
0153120  00026748 00026748 00810003 00000000 0007c49c 04000017 0000001f 00000010 0004dd34 0004dd48 00810030 00000000
0153200  0007c4bc 04000017 0000001f 00000010 0003ce3c 0003ce3c 0081001a 00000000 0007c4dc 04000017 0000001f 00000010
0153260  0003cd44 0003cd44 0081001a 00000000 0007c4fc 04000017 0000001f 00000010 00032754 00032754 00810010 00000000
0153340  0007c51c 04000017 0000001f 00000010 00054944 00054944 00810031 00000000 0007c53c 04000017 0000001f 00000010
0153420  000376e0 00037724 00810014 00000000 0007c55c 04000017 0000001f 00000010 0004afc4 0004afc4 0081002d 00000000
0153500  0007c57c 04000017 0000001f 00000010 00040be0 00040be0 00810020 00000000 0007c59c 04000017 0000001f 00000010
0153560  00027a0c 00027a7c 00810006 00000000 0007c5bc 04000017 0000001f 00000010 000443a0 000443a0 00810027 00000000
0153640  0007c5dc 04000017 0000001f 00000010 0002695c 000269c0 00810003 00000000 0007c5fc 04000017 0000001f 00000010
0153720  000375c4 000375f4 00810014 00000000 0007c61c 04000017 0000001f 00000010 00037598 000375b8 00810014 00000000
0154000  0007c63c 04000017 0000001f 00000010 0005431c 000545a8 00810031 00000000 0007c65c 04000017 0000001f 00000010
0154060  0003c928 0003c929 00a10018 00000000 0007c67c 04000017 0000001f 00000010 0003c96c 0003c96c 00a10018 00000000
0154140  0007c69c 04000017 0000001f 00000010 0003c8ac 0003c8ac 00a10018 00000000 0007c6bc 04000017 0000001f 00000010
0154220  000331f0 00033204 00810010 00000000 0007c6dc 04000017 0000001f 00000010 00027fa8 00027fa8 00810007 00000000
0154300  0007c6fc 04000017 0000001f 00000010 00028124 00028144 00810007 00000000 0007c71c 04000017 00000037 00000010
0154360  0002dd8c 0002dd8c 0081000d 00000000 0007c73c 04000017 0000001f 00000010 0005814c 00058190 00810035 00000000
0154440  0007c75c 04000017 0000001f 00000010 0003c1a0 0003c1a0 00a10018 00000000 0007c77c 04000017 0000001f 00000010
0154520  00031bc4 00031bc4 00810010 00000000 0007c79c 04000017 0000001f 00000010 0003c1c4 0003c1c4 00a10018 00000000
0154600  0007c7bc 04000017 0000001f 00000010 00050770 00050770 00810030 00000000 0007c7dc 04000017 0000001f 00000010
0154660  000419a4 00041acc 00810023 00000000 0007c7fc 04000017 0000001f 00000010 00038904 00038940 00810014 00000000
0154740  0007c81c 04000017 0000001f 00000010 0003783c 00037848 00810014 00000000 0007c83c 04000017 0000001f 00000010
0155020  00050124 00050124 00810030 00000000 0007c85c 04000017 0000001f 00000010 0003ac6c 0003acb8 00810017 00000000
0155100  0007c87c 04000017 0000001f 00000010 0003ec00 0003ec00 0081001c 00000000 0007c89c 04000017 0000001f 00000010
0155160  0003eb30 0003eb30 0081001c 00000000 0007c8bc 04000017 00000037 00000010 0002e5d8 0002e618 0081000d 00000000
0155240  0007c8dc 04000017 0000001f 00000010 00038bb0 00038bc4 00810014 00000000 0007c8fc 04000017 0000001f 00000010
0155320  00038b84 00038ba4 00810014 00000000 0007c91c 04000017 0000001f 00000010 0003351c 0003351c 00810010 00000000
0155400  0007c93c 04000017 0000001f 00000010 0003c888 0003c888 00a10018 00000000 0007c95c 04000017 0000001f 00000010
0155460  00037578 00037578 00810014 00000000 0007c97c 04000017 0000001f 00000010 0003ef1c 0003ef1c 0081001c 00000000
0155540  0007c99c 04000017 0000001f 00000010 0003ede0 0003ede0 0081001c 00000000 0007c9bc 04000017 00000027 00000010
```

| | | | | | | | | | | | | |
|---|---|---|---|---|---|---|---|---|---|---|---|---|
| 0155620 | 00047cc8 | 00047cc8 | 00810029 | 00000000 | 0007c9dc | 04000017 | 00000037 | 00000010 | 0002d34c | 0002d34c | 00a1000c | 00000000 |
| 0155700 | 0007c9fc | 04000017 | 00000027 | 00000010 | 00030b28 | 00030b28 | 0081000f | 00000000 | 0007ca1c | 04000017 | 0000001f | 00000010 |
| 0155760 | 00050cec | 00050d08 | 00810030 | 00000000 | 0007ca3c | 04000017 | 0000001f | 00000010 | 000519e0 | 00051a04 | 00810030 | 00000000 |
| 0156040 | 0007ca5c | 04000017 | 0000001f | 00000010 | 0003d614 | 0003d614 | 0081001a | 00000000 | 0007ca7c | 04000017 | 0000001f | 00000010 |
| 0156120 | 00051d4c | 00052020 | 00810030 | 00000000 | 0007ca9c | 04000017 | 0000001f | 00000010 | 00037630 | 00037630 | 00810014 | 00000000 |
| 0156200 | 0007cabc | 04000017 | 0000001f | 00000010 | 0003c640 | 0003c640 | 00a10019 | 00000000 | 0007cadc | 04000017 | 0000001f | 00000010 |
| 0156260 | 0003bc90 | 0003bc90 | 00810018 | 00000000 | 0007cafc | 04000017 | 00000027 | 00000010 | 00046e9c | 00046e9c | 00810029 | 00000000 |
| 0156340 | 0007cb1c | 04000017 | 0000002f | 00000010 | 00058e44 | 00058e70 | 00810037 | 00000000 | 0007cb3c | 04000017 | 0000002f | 00000010 |
| 0156420 | 000591b0 | 00059208 | 00810037 | 00000000 | 0007cb5c | 04000017 | 0000001f | 00000010 | 00052530 | 00052530 | 00810030 | 00000000 |
| 0156500 | 0007cb7c | 04000017 | 0000001f | 00000010 | 0003bf88 | 0003bf88 | 00a10019 | 00000000 | 0007cb9c | 04000017 | 0000001f | 00000010 |
| 0156560 | 0002a468 | 0002a468 | 0081000a | 00000000 | 0007cbbc | 04000017 | 0000001f | 00000010 | 0002a3b4 | 0002a3b4 | 0081000a | 00000000 |
| 0156640 | 0007cbdc | 04000017 | 0000001f | 00000010 | 0004f578 | 0004f578 | 00810030 | 00000000 | 0007cbfc | 04000017 | 0000002f | 00000010 |
| 0156720 | 00058dcc | 00058dcc | 00810037 | 00000000 | 0007cc1c | 04000017 | 0000001f | 00000010 | 0003f238 | 0003f2c4 | 0081001c | 00000000 |
| 0157000 | 0007cc3c | 04000017 | 0000001f | 00000010 | 00051408 | 00051408 | 00810030 | 00000000 | 0007cc5c | 04000017 | 00000037 | 00000010 |
| 0157060 | 0002f2b8 | 0002f2cc | 00810004 | 00000000 | 0007cc7c | 04000017 | 0000001f | 00000010 | 0003b668 | 0003b684 | 00810018 | 00000000 |
| 0157140 | 0007cc9c | 04000017 | 0000001f | 00000010 | 000393d0 | 00039408 | 00810014 | 00000000 | 0007ccbc | 04000017 | 0000001f | 00000010 |
| 0157220 | 0004a210 | 0004a2b4 | 0081002b | 00000000 | 0007ccdc | 04000017 | 00000027 | 00000010 | 000463e4 | 000463e4 | 00810029 | 00000000 |
| 0157300 | 0007ccfc | 04000017 | 0000001f | 00000010 | 000394ec | 0003953c | 00810014 | 00000000 | 0007cd1c | 04000017 | 0000001f | 00000010 |
| 0157360 | 0003f380 | 0003f380 | 0081001c | 00000000 | 0007cd3c | 04000017 | 0000001f | 00000010 | 00030208 | 00030208 | 0081000e | 00000000 |
| 0157440 | 0007cd5c | 04000017 | 0000001f | 00000010 | 0002fff0 | 00030004 | 0081000e | 00000000 | 0007cd7c | 04000017 | 0000001f | 00000010 |
| 0157520 | 000301b0 | 000301b0 | 0081000e | 00000000 | 0007cd9c | 04000017 | 0000001f | 00000010 | 0003001c | 000301a0 | 0081000e | 00000000 |
| 0157600 | 0007cdbc | 04000017 | 0000001f | 00000010 | 00057f20 | 00057fd0 | 00810035 | 00000000 | 0007cddc | 04000017 | 0000001f | 00000010 |
| 0157660 | 0004f7ac | 0004f7ac | 00810030 | 00000000 | 0007cdfc | 04000017 | 0000001f | 00000010 | 0004f080 | 0004f080 | 00810030 | 00000000 |
| 0157740 | 0007ce1c | 04000017 | 0000001f | 00000010 | 0004dd58 | 0004dd58 | 00810030 | 00000000 | 0007ce3c | 04000017 | 0000001f | 00000010 |
| 0160020 | 000383dc | 000383dc | 00810014 | 00000000 | 0007ce5c | 04000017 | 0000001f | 00000010 | 0003843c | 0003846c | 00810014 | 00000000 |
| 0160100 | 0007ce7c | 04000017 | 0000001f | 00000010 | 00038478 | 00038508 | 00810014 | 00000000 | 0007ce9c | 04000017 | 0000001f | 00000010 |
| 0160160 | 0003c580 | 0003c580 | 00a10018 | 00000000 | 0007cebc | 04000017 | 0000001f | 00000010 | 0004bf08 | 0004bfc8 | 0081002f | 00000000 |
| 0160240 | 0007cedc | 04000017 | 0000001f | 00000010 | 00025e04 | 00025e04 | 00810003 | 00000000 | 0007cefc | 04000017 | 0000001f | 00000010 |
| 0160320 | 00029d58 | 00029d58 | 00810009 | 00000000 | 0007cf1c | 04000017 | 0000001f | 00000010 | 00029cf8 | 00029cf8 | 00810009 | 00000000 |
| 0160400 | 0007cf3c | 04000017 | 0000001f | 00000010 | 00029034 | 00029034 | 00810009 | 00000000 | 0007cf5c | 04000017 | 0000001f | 00000010 |
| 0160460 | 00028e5c | 00028e5c | 00810009 | 00000000 | 0007cf7c | 04000017 | 0000001f | 00000010 | 00028c2c | 00028c6c | 00810009 | 00000000 |
| 0160540 | 0007cf9c | 04000017 | 0000001f | 00000010 | 0002894c | 0002894c | 00810009 | 00000000 | 0007cfbc | 04000017 | 0000001f | 00000010 |
| 0160620 | 00028a38 | 00028a38 | 00810009 | 00000000 | 0007cfdc | 04000017 | 0000001f | 00000010 | 0003862c | 00038670 | 00810014 | 00000000 |
| 0160700 | 0007cffc | 04000017 | 0000001f | 00000010 | 00038700 | 0003876c | 00810014 | 00000000 | 0007d01c | 04000017 | 0000001f | 00000010 |
| 0160760 | 00034dcc | 00034dcc | 00810012 | 00000000 | 0007d03c | 04000017 | 00000027 | 00000010 | 00048bd8 | 00048bd8 | 00810029 | 00000000 |
| 0161040 | 0007d05c | 04000017 | 0000001f | 00000010 | 0003c5a0 | 0003c5a0 | 00a10018 | 00000000 | 0007d07c | 04000017 | 0000001f | 00000010 |
| 0161120 | 000268ec | 000268ec | 00810003 | 00000000 | 0007d09c | 04000017 | 0000001f | 00000010 | 00026424 | 000264b0 | 00810003 | 00000000 |
| 0161200 | 0007d0bc | 04000017 | 0000001f | 00000010 | 0004db90 | 0004dba0 | 00810030 | 00000000 | 0007d0dc | 04000017 | 0000001f | 00000010 |
| 0161260 | 000283b8 | 000283b8 | 00810008 | 00000000 | 0007d0fc | 04000017 | 00000037 | 00000010 | 0002f39c | 0002f3d4 | 0081000d | 00000000 |
| 0161340 | 0007d11c | 04000017 | 00000037 | 00000010 | 0002f340 | 0002f340 | 0081000d | 00000000 | 0007d13c | 04000017 | 00000037 | 00000010 |
| 0161420 | 0002f2ec | 0002f2ec | 00810004 | 00000000 | 0007d15c | 04000017 | 00000037 | 00000010 | 0002f438 | 0002f470 | 0081000d | 00000000 |
| 0161500 | 0007d17c | 04000017 | 0000001f | 00000010 | 0005199c | 000519c0 | 00810030 | 00000000 | 0007d19c | 04000017 | 0000001f | 00000010 |
| 0161560 | 0003f0dc | 0003f138 | 0081001c | 00000000 | 0007d1bc | 04000017 | 0000001f | 00000010 | 00027ac4 | 00027bbc | 00810006 | 00000000 |
| 0161640 | 0007d1dc | 04000017 | 0000001f | 00000010 | 00027c48 | 00027c48 | 00810006 | 00000000 | 0007d1fc | 04000017 | 0000001f | 00000010 |
| 0161720 | 0004b570 | 0004b570 | 0081002f | 00000000 | 0007d21c | 04000017 | 0000002f | 00000010 | 000590a9 | 000590a8 | 00810037 | 00000000 |
| 0162000 | 0007d23c | 04000017 | 0000002f | 00000010 | 00059128 | 00059168 | 00810037 | 00000000 | 0007d25c | 04000017 | 0000001f | 00000010 |
| 0162060 | 00037544 | 00037544 | 00810014 | 00000000 | 0007d27c | 04000017 | 00000037 | 00000010 | 0002f024 | 0002f09c | 0081000d | 00000000 |
| 0162140 | 0007d29c | 04000017 | 0000001f | 00000010 | 00038318 | 00038358 | 00810014 | 00000000 | 0007d2bc | 04000017 | 0000001f | 00000010 |
| 0162220 | 00038580 | 000385f4 | 00810014 | 00000000 | 0007d2dc | 04000017 | 0000001f | 00000010 | 00038c20 | 00038c74 | 00810014 | 00000000 |
| 0162300 | 0007d2fc | 04000017 | 0000001f | 00000010 | 00051974 | 00051974 | 00810030 | 00000000 | 0007d31c | 04000017 | 0000001f | 00000010 |
| 0162360 | 00050910 | 00050944 | 00810030 | 00000000 | 0007d33c | 04000017 | 0000001f | 00000010 | 0003708c | 0003708c | 00810012 | 00000000 |
| 0162440 | 0007d35c | 04000017 | 0000001f | 00000010 | 00036f74 | 00036f74 | 00810012 | 00000000 | 0007d37c | 04000017 | 0000001f | 00000010 |
| 0162520 | 00036d84 | 00036db4 | 00810012 | 00000000 | 0007d39c | 04000017 | 0000001f | 00000010 | 00036fd8 | 00036fd8 | 00810012 | 00000000 |
| 0162600 | 0007d3bc | 04000017 | 0000001f | 00000010 | 00036dcc | 00036df8 | 00810012 | 00000000 | 0007d3dc | 04000017 | 0000001f | 00000010 |
| 0162660 | 0003a76c | 0003a76c | 00810017 | 00000000 | 0007d3fc | 04000017 | 0000001f | 00000010 | 0004a8cc | 0004a8cc | 00a1002c | 00000000 |

| | | | | | | | | | | | | |
|---|---|---|---|---|---|---|---|---|---|---|---|---|
| 0162740 | 0007d41c | 04000017 | 0000001f | 00000010 | 00034734 | 00034734 | 00810011 | 00000000 | 0007d43c | 04000017 | 0000001f | 00000010 |
| 0163020 | 00050564 | 000505f8 | 00810030 | 00000000 | 0007d45c | 04000017 | 0000003f | 00000010 | 000559f0 | 000559f0 | 00810033 | 00000000 |
| 0163100 | 0007d47c | 04000017 | 0000001f | 00000010 | 000430ec | 00043114 | 00810025 | 00000000 | 0007d49c | 04000017 | 0000001f | 00000010 |
| 0163160 | 00025798 | 00025830 | 00810003 | 00000000 | 0007d4bc | 04000017 | 0000001f | 00000010 | 0004b20c | 0004b20c | 0081002e | 00000000 |
| 0163240 | 0007d4dc | 04000017 | 0000001f | 00000010 | 0003f1e0 | 0003f1e0 | 0081001c | 00000000 | 0007d4fc | 04000017 | 0000001f | 00000010 |
| 0163320 | 000302e8 | 000302e8 | 0081000e | 00000000 | 0007d51c | 04000017 | 0000001f | 00000010 | 00042c68 | 00042c80 | 00810025 | 00000000 |
| 0163400 | 0007d53c | 04000017 | 00000027 | 00000010 | 00047648 | 00047648 | 00810029 | 00000000 | 0007d55c | 04000017 | 0000001f | 00000010 |
| 0163460 | 0002461c | 00024678 | 00810001 | 00000000 | 0007d57c | 05000017 | 0000001f | 00000014 | 00035ee0 | 00035f50 | 00810012 | 00000000 |
| 0163540 | 0007d59c | 05000017 | 0000001f | 00000014 | 000455fc | 000455fc | 00810027 | 00000000 | 0007d5bc | 05000017 | 0000001f | 00000014 |
| 0163620 | 00052dd8 | 00052dd8 | 00810030 | 00000000 | 0007d5dc | 05000017 | 0000001f | 00000014 | 0002ff68 | 0002ffd8 | 0081000e | 00000000 |
| 0163700 | 0007d5fc | 05000017 | 0000001f | 00000014 | 000380b4 | 00038154 | 00810014 | 00000000 | 0007d61c | 05000017 | 00000027 | 00000014 |
| 0163760 | 00045de4 | 00045de4 | 00810029 | 00000000 | 0007d63c | 05000017 | 0000001f | 00000014 | 0004e734 | 0004e734 | 00810030 | 00000000 |
| 0164040 | 0007d65c | 05000017 | 0000001f | 00000014 | 0004dae0 | 0004dae0 | 00810030 | 00000000 | 0007d67c | 05000017 | 0000001f | 00000014 |
| 0164120 | 0004deb4 | 0004dfa8 | 00810030 | 00000000 | 0007d69c | 05000017 | 0000001f | 00000014 | 0004cd58 | 0004cf70 | 00810030 | 00000000 |
| 0164200 | 0007d6bc | 05000017 | 0000001f | 00000014 | 0004d210 | 0004dac0 | 00810030 | 00000000 | 0007d6dc | 05000017 | 0000001f | 00000014 |
| 0164260 | 0004e2d8 | 0004e418 | 00810030 | 00000000 | 0007d6fc | 05000017 | 0000001f | 00000014 | 00042428 | 0004243c | 00810024 | 00000000 |
| 0164340 | 0007d71c | 05000017 | 0000001f | 00000014 | 0003c9e8 | 0003c9e8 | 00a10018 | 00000000 | 0007d73c | 05000017 | 0000001f | 00000014 |
| 0164420 | 0003d748 | 0003dcc0 | 0081001a | 00000000 | 0007d75c | 05000017 | 0000001f | 00000014 | 0004bcc4 | 0004bcc4 | 0081002f | 00000000 |
| 0164500 | 0007d77c | 05000017 | 0000001f | 00000014 | 00040958 | 000409b4 | 00810020 | 00000000 | 0007d79c | 05000017 | 0000001f | 00000014 |
| 0164560 | 00040820 | 00040900 | 00810020 | 00000000 | 0007d7bc | 05000017 | 00000027 | 00000014 | 00048918 | 00048918 | 00810029 | 00000000 |
| 0164640 | 0007d7dc | 05000017 | 00000027 | 00000014 | 0004883c | 0004883c | 00810029 | 00000000 | 0007d7fc | 05000017 | 00000027 | 00000014 |
| 0164720 | 00047080 | 00047080 | 00810029 | 00000000 | 0007d81c | 05000017 | 0000001f | 00000014 | 0002ff00 | 0002ff54 | 0081000e | 00000000 |
| 0165000 | 0007d83c | 05000017 | 0000001f | 00000014 | 00045848 | 000458a4 | 00810027 | 00000000 | 0007d85c | 05000017 | 0000001f | 00000014 |
| 0165060 | 0002602c | 0002602c | 00810003 | 00000000 | 0007d87c | 05000017 | 0000001f | 00000014 | 00035fec | 00035fec | 00810012 | 00000000 |
| 0165140 | 0007d89c | 05000017 | 0000001f | 00000014 | 00037668 | 00037668 | 00810014 | 00000000 | 0007d8bc | 05000017 | 0000001f | 00000014 |
| 0165220 | 000545dc | 00054634 | 00810031 | 00000000 | 0007d8dc | 05000017 | 0000001f | 00000014 | 000581b0 | 000581f0 | 00810035 | 00000000 |
| 0165300 | 0007d8fc | 05000017 | 0000001f | 00000014 | 00031c00 | 00031c00 | 00810010 | 00000000 | 0007d91c | 05000017 | 0000001f | 00000014 |
| 0165360 | 00033ba0 | 00033ba0 | 00810011 | 00000000 | 0007d93c | 05000017 | 0000001f | 00000014 | 0003980c | 000398e0 | 00810014 | 00000000 |
| 0165440 | 0007d95c | 05000017 | 0000001f | 00000014 | 00035fa0 | 00035fa0 | 00810012 | 00000000 | 0007d97c | 05000017 | 0000001f | 00000014 |
| 0165520 | 00039278 | 000392c4 | 00810014 | 00000000 | 0007d99c | 05000017 | 0000001f | 00000014 | 0003943c | 00039478 | 00810014 | 00000000 |
| 0165600 | 0007d9bc | 05000017 | 0000001f | 00000014 | 0004dc94 | 0004dc94 | 00810030 | 00000000 | 0007d9dc | 05000017 | 0000001f | 00000014 |
| 0165660 | 0003eb60 | 0003eb60 | 0081001c | 00000000 | 0007d9fc | 05000017 | 0000001f | 00000014 | 000457d0 | 0004582c | 00810027 | 00000000 |
| 0165740 | 0007da1c | 05000017 | 0000001f | 00000014 | 0003bdfc | 0003bdfc | 00810018 | 00000000 | 0007da3c | 05000017 | 0000002f | 00000014 |
| 0166020 | 00058b84 | 00058b84 | 00a10036 | 00000000 | 0007da5c | 05000017 | 0000001f | 00000014 | 00025b50 | 00025b50 | 00810003 | 00000000 |
| 0166100 | 0007da7c | 05000017 | 0000001f | 00000014 | 0003ef84 | 0003ef84 | 0081001c | 00000000 | 0007da9c | 05000017 | 0000001f | 00000014 |
| 0166160 | 0003ee48 | 0003ee48 | 0081001c | 00000000 | 0007dabc | 05000017 | 00000027 | 00000014 | 00047d0c | 00047d50 | 00810029 | 00000000 |
| 0166240 | 0007dadc | 05000017 | 0000002f | 00000014 | 0005985c | 00059c20 | 00810037 | 00000000 | 0007dafc | 05000017 | 0000001f | 00000014 |
| 0166320 | 00045744 | 000457a0 | 00810027 | 00000000 | 0007db1c | 05000017 | 00000027 | 00000014 | 00031530 | 00031530 | 0081000f | 00000000 |
| 0166400 | 0007db3c | 05000017 | 0000001f | 00000014 | 00039bdc | 00039cb8 | 00810016 | 00000000 | 0007db5c | 05000017 | 0000001f | 00000014 |
| 0166460 | 00039cd4 | 00039d1c | 00810016 | 00000000 | 0007db7c | 05000017 | 0000001f | 00000014 | 0003bc04 | 0003bc5c | 00810018 | 00000000 |
| 0166540 | 0007db9c | 05000017 | 0000001f | 00000014 | 00035cc4 | 00035d54 | 00810012 | 00000000 | 0007dbbc | 05000017 | 0000001f | 00000014 |
| 0166620 | 000525c4 | 000525c4 | 00810030 | 00000000 | 0007dbdc | 05000017 | 0000001f | 00000014 | 0003f2f4 | 0003f330 | 0081001c | 00000000 |
| 0166700 | 0007dbfc | 05000017 | 0000001f | 00000014 | 0004ea98 | 0004ead4 | 00810030 | 00000000 | 0007dc1c | 05000017 | 0000001f | 00000014 |
| 0166760 | 00035e60 | 00035e8c | 00810012 | 00000000 | 0007dc3c | 05000017 | 0000001f | 00000014 | 0003e11c | 0003e11c | 0081001a | 00000000 |
| 0167040 | 0007dc5c | 05000017 | 0000001f | 00000014 | 0002fe98 | 0002fee8 | 0081000e | 00000000 | 0007dc7c | 05000017 | 0000001f | 00000014 |
| 0167120 | 0002a4c8 | 0002a50c | 0081000a | 00000000 | 0007dc9c | 05000017 | 0000001f | 00000014 | 00028a78 | 00028a78 | 00810009 | 00000000 |
| 0167200 | 0007dcbc | 05000017 | 0000001f | 00000014 | 0003f148 | 0003f194 | 0081001c | 00000000 | 0007dcdc | 05000017 | 0000001f | 00000014 |
| 0167260 | 00027be8 | 00027c28 | 00810005 | 00000000 | 0007dcfc | 05000017 | 00000037 | 00000014 | 0002f0c4 | 0002f220 | 0081000d | 00000000 |
| 0167340 | 0007dd1c | 05000017 | 0000001f | 00000014 | 00035278 | 000352d0 | 00810012 | 00000000 | 0007dd3c | 05000017 | 00000037 | 00000014 |
| 0167420 | 0002e664 | 0002e6d8 | 00810004 | 00000000 | 0007dd5c | 05000017 | 0000001f | 00000014 | 00041ae4 | 00041c24 | 00810023 | 00000000 |
| 0167500 | 0007dd7c | 05000017 | 0000001f | 00000014 | 00041c38 | 00041c38 | 00810023 | 00000000 | 0007dd9c | 05000017 | 0000001f | 00000014 |
| 0167560 | 000459cc | 000459cc | 00810028 | 00000000 | 0007ddbc | 05000017 | 0000001f | 00000014 | 000555d8 | 000555d8 | 00810032 | 00000000 |
| 0167640 | 0007dddc | 05000017 | 0000001f | 00000014 | 0004b25c | 0004b25c | 0081002e | 00000000 | 0007ddfc | 05000017 | 0000001f | 00000014 |
| 0167720 | 0004e930 | 0004e930 | 00810030 | 00000000 | 0007de1c | 05000017 | 0000001f | 00000014 | 00039154 | 000391b4 | 00810014 | 00000000 |
| 0170000 | 0007de3c | 05000017 | 00000027 | 00000014 | 00047448 | 00047478 | 00810029 | 00000000 | 0007de5c | 05000017 | 0000001f | 00000014 |

| | | | | | | | | | | | | |
|---|---|---|---|---|---|---|---|---|---|---|---|---|
| 0170060 | 00053e84 | 00053e84 | 00810031 | 00000000 | 0007de7c | 06000017 | 00000037 | 00000018 | 0002d50c | 0002d50c | 0081000d | 00000000 |
| 0170140 | 0007de9c | 06000017 | 0000001f | 00000018 | 00042388 | 000423c8 | 00810024 | 00000000 | 0007debc | 06000017 | 0000001f | 00000018 |
| 0170220 | 0003c27c | 0003c27c | 00a10018 | 00000000 | 0007dedc | 06000017 | 00000037 | 00000018 | 0002f7d0 | 0002f7d0 | 0081000d | 00000000 |
| 0170300 | 0007defc | 06000017 | 0000001f | 00000018 | 00052c00 | 00052c00 | 00810030 | 00000000 | 0007df1c | 06000017 | 0000001f | 00000018 |
| 0170360 | 0003b70c | 0003b8e0 | 00810018 | 00000000 | 0007df3c | 06000017 | 0000001f | 00000018 | 00054658 | 00054798 | 00810031 | 00000000 |
| 0170440 | 0007df5c | 06000017 | 0000001f | 00000018 | 000516e4 | 000517cc | 00810030 | 00000000 | 0007df7c | 06000017 | 0000001f | 00000018 |
| 0170520 | 0002a530 | 0002a5b0 | 00810003 | 00000000 | 0007df9c | 06000017 | 0000001f | 00000018 | 00035058 | 000350fc | 00810012 | 00000000 |
| 0170600 | 0007dfbc | 06000017 | 00000027 | 00000018 | 00045f2c | 00045f2c | 00810029 | 00000000 | 0007dfdc | 06000017 | 00000027 | 00000018 |
| 0170660 | 0003172c | 0003172c | 0081000f | 00000000 | 0007dffc | 06000017 | 0000001f | 00000018 | 000368f4 | 00036970 | 00810012 | 00000000 |
| 0170740 | 0007e01c | 06000017 | 0000001f | 00000018 | 0003697c | 0003697c | 00810012 | 00000000 | 0007e03c | 06000017 | 00000027 | 00000018 |
| 0171020 | 00046b40 | 00046b40 | 00810029 | 00000000 | 0007e05c | 06000017 | 00000037 | 00000018 | 0002e360 | 0002e360 | 0081000d | 00000000 |
| 0171100 | 0007e07c | 06000017 | 00000027 | 00000018 | 0004623c | 0004623c | 00810029 | 00000000 | 0007e09c | 06000017 | 0000001f | 00000018 |
| 0171160 | 0003e140 | 0003e140 | 0081001a | 00000000 | 0007e0bc | 06000017 | 0000001f | 00000018 | 000391c4 | 000391fc | 00810014 | 00000000 |
| 0171240 | 0007e0dc | 06000017 | 0000001f | 00000018 | 00036a58 | 00036b04 | 00810012 | 00000000 | 0007e0fc | 06000017 | 00000027 | 00000018 |
| 0171320 | 00049570 | 00049570 | 00810029 | 00000000 | 0007e11c | 06000017 | 0000001f | 00000018 | 00027214 | 00027214 | 00810004 | 00000000 |
| 0171400 | 0007e13c | 07000017 | 00000037 | 0000001c | 0002d52c | 0002d52c | 0081000d | 00000000 | 0007e15c | 07000017 | 0000001f | 0000001c |
| 0171460 | 00026220 | 00026220 | 00810003 | 00000000 | 0007e17c | 07000017 | 00000027 | 0000001c | 000470b0 | 000470b0 | 00810029 | 00000000 |
| 0171540 | 0007e19c | 07000017 | 0000001f | 0000001c | 00045bc4 | 00045bc4 | 00810028 | 00000000 | 0007e1bc | 07000017 | 00000037 | 0000001c |
| 0171620 | 0002dff4 | 0002dff4 | 00810004 | 00000000 | 0007e1dc | 07000017 | 00000037 | 0000001c | 0002de7c | 0002df14 | 0081000d | 00000000 |
| 0171700 | 0007e1fc | 07000017 | 0000001f | 0000001c | 00051488 | 000515b4 | 00810030 | 00000000 | 0007e21c | 07000017 | 0000001f | 0000001c |
| 0171760 | 0003e1d4 | 0003e5e8 | 0081001a | 00000000 | 0007e23c | 07000017 | 00000027 | 0000001c | 00031044 | 00031044 | 0081000f | 00000000 |
| 0172040 | 0007e25c | 07000017 | 0000001f | 0000001c | 0003d68c | 0003d68c | 0081001a | 00000000 | 0007e27c | 07000017 | 0000001f | 0000001c |
| 0172120 | 0003de60 | 0003dee4 | 0081001a | 00000000 | 0007e29c | 08000017 | 0000001f | 00000020 | 00044bc4 | 00044bc4 | 00810027 | 00000000 |
| 0172200 | 0007e2bc | 08000017 | 00000037 | 00000020 | 0002da78 | 0002db74 | 0081000d | 00000000 | 0007e2dc | 08000017 | 00000037 | 00000020 |
| 0172260 | 0002d644 | 0002da48 | 00810003 | 00000000 | 0007e2fc | 08000017 | 0000001f | 00000020 | 000547d4 | 00054900 | 00810031 | 00000000 |
| 0172340 | 0007e31c | 08000017 | 0000001f | 00000020 | 00053c14 | 00053c14 | 00810031 | 00000000 | 0007e33c | 08000017 | 00000027 | 00000020 |
| 0172420 | 00046c10 | 00046c10 | 00810029 | 00000000 | 0007e35c | 08000017 | 0000001f | 00000020 | 00035114 | 00035204 | 00810012 | 00000000 |
| 0172500 | 0007e37c | 08000017 | 0000001f | 00000020 | 0004fa50 | 0004fc18 | 00810030 | 00000000 | 0007e39c | 08000017 | 00000037 | 00000020 |
| 0172560 | 0002e410 | 0002e554 | 0081000d | 00000000 | 0007e3bc | 09000017 | 00000037 | 00000024 | 0002e0bc | 0002e30c | 0081000d | 00000000 |
| 0172640 | 0007e3dc | 0a000017 | 0000001f | 00000028 | 00054180 | 00054180 | 00810031 | 00000000 | 0007e3fc | 0b000017 | 0000001f | 0000002c |
| 0172720 | 00053fa0 | 00054018 | 00810031 | 00000000 | 0007e41c | 0b000017 | 00000037 | 0000002c | 0002dba4 | 0002dd40 | 0081000d | 00000000 |
| 0173000 | ffffffff | 0000083f | 0000001f | 00000000 | 0003991c | 0003991c | 00810015 | 00000000 | ffffffff | 010008a7 | 0000001f | 00000004 |
| 0173060 | 0003ae94 | 0003ae94 | 00810017 | 00000000 | ffffffff | 010008bf | 0000001f | 00000004 | 000372e8 | 000372e8 | 00810014 | 00000000 |
| 0173140 | ffffffff | 040008c7 | 0000001f | 00000010 | 0003b328 | 0003b328 | 00810017 | 00000000 | ffffffff | 010008cf | 0000001f | 00000004 |
| 0173220 | 0003c4cc | 0003c4cc | 00a10019 | 00000000 | ffffffff | 030008d7 | 0000001f | 0000000c | 0003be74 | 0003be74 | 00810018 | 00000000 |
| 0173300 | ffffffff | 020008df | 0000001f | 00000008 | 00041180 | 00041180 | 00810023 | 00000000 | ffffffff | 030008e7 | 0000001f | 0000000c |
| 0173360 | 0003bd40 | 0003bd40 | 00810018 | 00000000 | ffffffff | 020008ef | 0000001f | 00000008 | 0003aea4 | 0003aea4 | 00810017 | 00000000 |
| 0173440 | ffffffff | 010008f7 | 0000001f | 00000004 | 000401b0 | 000401cc | 0081001e | 00000000 | ffffffff | 02000917 | 00000027 | 00000008 |
| 0173520 | 000589ec | 000589ec | 00810036 | 00000000 | ffffffff | 0400091f | 0000005f | 00000010 | 000939e0 | 0002438a | 00030000 | 00000000 |
| 0173600 | ffffffff | 02000927 | 0000001f | 00000008 | 00034e14 | 00034e14 | 00810012 | 00000000 | ffffffff | 02000947 | 00000027 | 00000008 |
| 0173660 | 000309b0 | 000309b0 | 0081000f | 00000000 | ffffffff | 02000a3f | 0000001f | 00000008 | 000398b0 | 000398b0 | 00810015 | 00000000 |
| 0173740 | ffffffff | 02000a67 | 0000001f | 00000008 | 000398f8 | 000398f8 | 00810015 | 00000000 | ffffffff | 0200000f | 0000001f | 00000008 |
| 0174020 | 000348fc | 000348fc | 00810012 | 00000000 | ffffffff | 02000cdf | 00000027 | 00000008 | 0003053c | 0003053c | 0081000f | 00000000 |
| 0174100 | ffffffff | 01000ce7 | 0000001f | 00000004 | 0003afd8 | 0003afd8 | 00810017 | 00000000 | 0007e69c | 02000ce7 | 0000001f | 00000008 |
| 0174160 | 0003aff8 | 0003aff8 | 00810017 | 00000000 | ffffffff | 02000d0f | 0000001f | 00000008 | 000398d4 | 000398d4 | 00810015 | 00000000 |
| 0174240 | ffffffff | 02000d17 | 0000001f | 00000008 | 00039830 | 00039830 | 00810015 | 00000000 | ffffffff | 02000d27 | 0000001f | 00000008 |
| 0174320 | 0003968c | 0003968c | 00810015 | 00000000 | ffffffff | 02000d2f | 0000001f | 00000008 | 0003a00c | 0003a098 | 00810017 | 00000000 |
| 0174400 | ffffffff | 02000d37 | 0000001f | 00000008 | 000397f0 | 000397f0 | 00810015 | 00000000 | ffffffff | 02000d3f | 0000001f | 00000008 |
| 0174460 | 00039870 | 00039870 | 00810015 | 00000000 | ffffffff | 02000d47 | 0000001f | 00000008 | 00039770 | 00039770 | 00810015 | 00000000 |
| 0174540 | ffffffff | 02000d4f | 0000001f | 00000008 | 00039810 | 00039810 | 00810015 | 00000000 | ffffffff | 02000d57 | 0000001f | 00000008 |
| 0174620 | 00039850 | 00039850 | 00810015 | 00000000 | ffffffff | 02000d5f | 0000001f | 00000008 | 00039890 | 00039890 | 00810015 | 00000000 |
| 0174700 | ffffffff | 01000d77 | 0000001f | 00000004 | 0003afb8 | 0003afb8 | 00810017 | 00000000 | ffffffff | 02000d7f | 0000001f | 00000008 |
| 0174760 | 00039720 | 00039720 | 00810015 | 00000000 | ffffffff | 02000d87 | 0000001f | 00000008 | 00039748 | 00039748 | 00810015 | 00000000 |
| 0175040 | ffffffff | 02000d8f | 0000001f | 00000008 | 00039734 | 00039734 | 00810015 | 00000000 | ffffffff | 02000d97 | 0000001f | 00000008 |
| 0175120 | 0003975c | 0003975c | 00810015 | 00000000 | ffffffff | 03000da7 | 0000001f | 0000000c | 0003a250 | 0003a250 | 00810017 | 00000000 |

```
0175200 ffffffff 00000fe7 0000001f 00000000 0003aed0 0003aed0 00810017 00000000 ffffffff 00001007 0000001f 00000000
0175260 0003aef0 0003aef0 00810017 00000000 ffffffff 0100147f 0000005f 00000004 000939e0 0002438a 00030013 00000000
0175340 0007e8fc 00000007 0000001f 00000000 00034948 00034948 00810012 00000000 ffffffff 01001647 0000001f 00000004
0175420 000397a8 000397a8 00810015 00000000 ffffffff 02001657 0000001f 00000008 00039784 00039784 00810015 00000000
0175500 ffffffff 0200166f 0000001f 00000008 00039798 00039798 00810015 00000000 ffffffff 01001aaf 0000001f 00000004
0175560 0002438c 000243e0 00810001 00000000 0007e9bc 02001aaf 0000001f 00000008 0002459c 000245ec 00810001 00000000
0175640 0007e9dc 03001aaf 0000001f 0000000c 000246ac 000246d8 00810001 00000000 ffffffff 00001ab7 0000001f 00000000
0175720 0003b120 0003b120 00810017 00000000 ffffffff 00001abf 0000001f 00000000 00057634 00057634 00810035 00000000
0176000 ffffffff 02001acf 0000001f 00000008 00033440 00033440 00810010 00000000 0007ea5c 03001acf 0000001f 0000000c
0176060 00033460 000334bc 00810010 00000000 ffffffff 05001b0f 00000057 00000014 000939e0 0002438a 00030000 00000000
0176140 ffffffff 01001b17 00000027 00000004 00047f34 00047f34 00810029 00000000 ffffffff 03001b3f 0000001f 0000000c
0176220 0003a1e0 0003a1e0 00810017 00000000 ffffffff 02001b47 0000001f 00000008 00093a08 00093a08 00000000 00000000
0176300 ffffffff 02001b4f 0000001f 00000008 00093a0a 00093a0a 00000000 00000000 ffffffff 02001b57 0000001f 00000008
0176360 00093a0c 00093a0c 00000000 00000000 ffffffff 03001b5f 0000001f 0000000c 00039708 00039708 00810015 00000000
0176440 ffffffff 01001b77 0000001f 00000004 000251cc 000251cc 00810003 00000000 0007eb7c 02001b77 0000001f 00000008
0176520 00025214 00025214 00810003 00000000 ffffffff 01001b7f 0000001f 00000004 000251e4 000251e4 00810003 00000000
0176600 0007ebbc 02001b7f 0000001f 00000008 0002522c 0002522c 00810003 00000000 ffffffff 01001b87 0000001f 00000004
0176660 000251fc 000251fc 00810003 00000000 0007ebfc 02001b87 0000001f 00000008 00025244 00025244 00810003 00000000
0176740 ffffffff 01001b97 0000001f 00000004 000396c8 000396c8 00810015 00000000 ffffffff 02001ba7 0000001f 00000008
0177020 0003a384 0003a3e4 00810017 00000000 ffffffff 01001baf 0000001f 00000004 000396b8 000396b8 00810015 00000000
0177100 ffffffff 03001bef 0000001f 0000000c 0003e914 0003e914 0081001c 00000000 0007ec9c 04001bef 0000001f 00000010
0177160 0003e950 0003ea2c 0081001c 00000000 ffffffff 00001c1f 0000001f 00000000 000577a8 000577a8 00810035 00000000
0177240 ffffffff 02001c27 00000057 00000008 000939e0 000939e0 00000000 00000000 ffffffff 01001c67 00000027 00000004
0177320 00030568 00030568 0081000f 00000000 0007ed1c 02001c67 00000027 00000008 00030590 00030590 0081000f 00000000
0177400 ffffffff 01001c6f 0000001f 00000004 0003b0e0 0003b0e0 00810017 00000000 ffffffff 00001cc7 0000001f 00000000
0177460 00049ed8 00049ed8 0081002a 00000000 ffffffff 00001ccf 0000001f 00000000 000440c0 000440c0 00810026 00000000
0177540 0007ed9c 01001ccf 0000001f 00000004 000440e4 0004411c 00810026 00000000 ffffffff 02001cff 0000001f 00000008
0177620 00032410 0003243c 00810010 00000000 ffffffff 02001d1f 0000001f 00000008 00025b80 00025bf0 00810003 00000000
0177700 0007edfc 03001d1f 0000001f 0000000c 00025c50 00025de0 00810003 00000000 0007e75c 01001d37 0000001f 00000004
0177760 00031de4 00031f80 00810010 00000000 0007e79c 03001d47 0000001f 0000000c 000271cc 000271cc 00810004 00000000
0200040 0007e7dc 01001d57 0000001f 00000004 000348cc 000348cc 00810012 00000000 0007ee7c 03001d57 0000001f 0000000c
0200120 0004c614 0004c614 00810030 00000000 0007e83c 01001d7f 0000001f 00000004 000348e4 000348e4 00810012 00000000
0200200 0007e87c 02001d8f 0000001f 00000008 00026694 00026694 00810003 00000000 0007e8bc 01001da7 0000001f 00000004
0200260 00027e38 00027e48 00810006 00000000 0007eefc 02001da7 0000001f 00000008 00027e6c 00027eb0 00810006 00000000
0200340 ffffffff 02001daf 0000001f 00000008 00037b4c 00037b4c 00810014 00000000 ffffffff 02001db7 0000001f 00000008
0200420 0003af94 0003af94 00810017 00000000 ffffffff 01001dbf 0000001f 00000004 000323b8 000323b8 00810010 00000000
0200500 ffffffff 02001dc7 0000001f 00000008 00026b0c 00026b9c 00810003 00000000 ffffffff 01001dcf 0000001f 00000004
0200560 0003724c 00037260 00810014 00000000 0007efbc 02001dcf 0000001f 00000008 000372d8 000372d8 00810014 00000000
0200640 ffffffff 03001dd7 0000001f 0000000c 00039ec0 00039f30 00810016 00000000 ffffffff 01001ddf 0000001f 00000004
0200720 000323e4 000323e4 00810010 00000000 ffffffff 02001de7 0000001f 00000008 00027d6c 00027d6c 00810006 00000000
0201000 0007f03c 03001de7 0000001f 0000000c 00027de8 00027de8 00810006 00000000 ffffffff 03001def 0000001f 0000000c
0201060 0003204c 0003204c 00810010 00000000 0007f07c 04001def 0000001f 00000010 00032074 000320c4 00810010 00000000
0201140 0007f09c 05001def 0000001f 00000014 000320f4 000320f4 00810010 00000000 ffffffff 00001e07 00000027 00000000
0201220 0004845c 0004845c 00810029 00000000 ffffffff 00001e0f 00000027 00000000 000491fc 000491fc 00810029 00000000
0201300 ffffffff 02001e17 00000057 00000008 000939e0 0002438a 00030000 00000000 ffffffff 01001e1f 00000027 00000004
0201360 00047ef0 00047ef0 00810029 00000000 ffffffff 00001e27 0000001f 00000000 000939e0 0002438a 00030039 00000000
0201440 ffffffff 01001e4f 0000001f 00000004 00027f0c 00027f0c 00810007 00000000 ffffffff 02001e57 00000057 00000008
0201520 000939e0 0002438a 00030003 00000000 ffffffff 01001e6f 0000001f 00000004 0003b01c 0003b01c 00810017 00000000
0201600 ffffffff 01001ebf 0000001f 00000004 00034968 00034968 00810012 00000000 ffffffff 01001ec7 0000001f 00000004
0201660 00026aa4 00026aa4 00810003 00000000 ffffffff 00001ecf 0000001f 00000000 000576c4 000576c4 00810035 00000000
0201740 ffffffff 02001eef 0000001f 00000008 0002fdcc 0002fdcc 0081000e 00000000 ffffffff 00001f17 0000001f 00000000
0202020 0003993c 0003993c 00810015 00000000 ffffffff 00001f4f 0000001f 00000000 0003995c 0003995c 00810015 00000000
0202100 ffffffff 02001f6f 00000057 00000008 000939e0 000a0eec 00030000 00000000 0007f29c 02001f6f 0000004f 00000008
0202160 000939e0 0002438a 0013003a 00000000 ffffffff 02001f77 00002c07 00000008 000939e0 0009a58c 00030000 00000000
0202240 ffffffff 00001f7f 0000001f 00000000 0002d2c4 0002d2c4 0081000c 00000000 0007f2fc 02001f7f 0000001f 00000008
```

```
0202320  0002d2f4 0002d2f4 0081000c 00000000 ffffffff 01001f8f 00000027 00000004 00047b1c 00047b50 00810029 00000000
0202400  0007f33c 03001f8f 0000001f 0000000c 0004a1f0 0004a1f0 0081002b 00000000 ffffffff 01001f97 0000001f 00000004
0202460  00049e28 00049e28 0081002a 00000000 ffffffff 03001f9f 0000001f 0000000c 0004a1cc 0004a1cc 0081002b 00000000
0202540  ffffffff 03001fa7 0000001f 0000000c 0003e8cc 0003e8cc 0081001c 00000000 ffffffff 00001fb7 0000001f 00000000
0202620  000575cc 000575cc 00810035 00000000 ffffffff 01001fbf 0000001f 00000004 000396e8 000396e8 00810015 00000000
0202700  ffffffff 01001fcf 0000001f 00000004 000322ec 00032310 00810010 00000000 0007e93c 03002007 0000005f 0000000c
0202760  000939e0 000939e0 00000000 00000000 0007e65c 0200200f 0000005f 00000008 000939e0 000939e0 00000000 00000000
0203040  ffffffff 02002017 00000037 00000008 0002d3d8 0002d418 0081000d 00000000 0007f47c 03002017 00000037 0000000c
0203120  0002d388 0002d388 0081000d 00000000 ffffffff 03002037 0000001f 0000000c 00039714 00039714 00810015 00000000
0203200  ffffffff 0000205f 0000001f 00000000 0003aec0 0003aec0 00810017 00000000 ffffffff 0000206f 0000001f 00000000
0203260  0002d0cc 0002d0cc 0081000c 00000000 ffffffff 0300209f 0000001f 0000000c 0002d10c 0002d150 0081000c 00000000
0203340  ffffffff 010020bf 0000001f 00000004 00032934 00032934 00810010 00000000 0007f53c 020020bf 0000001f 00000008
0203420  000328a8 0003290c 00810010 00000000 ffffffff 010020c7 0000001f 00000004 0003c360 0003c360 00a10018 00000000
0203500  0007f57c 020020c7 0000001f 00000008 00032668 00032698 00810010 00000000 ffffffff 030020e7 0000001f 0000000c
0203560  00059ffc 00059ffc 00810039 00000000 ffffffff 000020ff 0000001f 00000000 0003b0fc 0003b0fc 00810017 00000000
0203640  ffffffff 04002107 0000004f 00000010 000939e0 000707c8 0013003a 00000000 ffffffff 0000211f 0000001f 00000000
0203720  0004a6cc 0004a6e0 0081002c 00000000 0007f61c 0100211f 0000001f 00000004 0004acc8 0004ad14 0081002d 00000000
0204000  ffffffff 03002137 0000005f 0000000c 000939e0 0002438a 00130013 00000000 ffffffff 02002157 0000004f 00000008
0204060  000939e0 0002438a 00030000 00000000 ffffffff 0400217f 0000004f 00000010 000939e0 00070664 0013003a 00000000
0204140  ffffffff 0200218f 0000004f 00000008 000939e0 000a25a4 0013003a 00000000 ffffffff 010021af 00000027 00000004
0204220  00030550 00030550 0081000f 00000000 ffffffff 040021c7 0000001f 00000010 0003d5e4 0003d5e4 0081001a 00000000
0204300  ffffffff 020021df 0000001f 00000008 000269d8 000269d8 00810003 00000000 0007f71c 030021df 0000001f 0000000c
0204360  000269e8 000269e8 00810003 00000000 ffffffff 010021ef 0000001f 00000004 000396d8 000396d8 00810015 00000000
0204440  ffffffff 0200226f 0000001f 00000008 000397d0 000397d0 00810015 00000000 ffffffff 0200229f 00000057 00000008
0204520  000939e0 0002438a 00030000 00000000 ffffffff 020022af 0000001f 00000008 0002758c 000275c8 00810004 00000000
0204600  0007f7bc 040022af 0000001f 00000010 000275ec 000276a0 00810004 00000000 ffffffff 010022c7 00000027 00000004
0204660  00048cbc 00048cbc 00810029 00000000 0007f7fc 020022c7 00000027 00000008 00048cd0 00048cd0 00810029 00000000
0204740  ffffffff 020022df 0000001f 00000008 0003a288 0003a2a8 00810017 00000000 0007f83c 030022df 0000001f 0000000c
0205020  0003a32c 0003a32c 00810017 00000000 ffffffff 0200230f 0000001f 00000008 00032464 00032490 00810010 00000000
0205100  ffffffff 02002317 0000001f 00000008 000324b8 000324e4 00810010 00000000 ffffffff 0100232f 0000001f 00000004
0205160  00057984 00057984 00810035 00000000 0007f8bc 0200232f 0000001f 00000008 0005799c 0005799c 00810035 00000000
0205240  ffffffff 00002337 0000001f 00000000 00033c10 00033c10 00810011 00000000 0007f8fc 01002337 0000001f 00000004
0205320  00033c34 00033c34 00810011 00000000 0007f91c 02002337 0000001f 00000008 00033c4c 00033c7c 00810011 00000000
0205400  ffffffff 0200234f 0000001f 00000008 00034a14 00034a14 00810012 00000000 0007f95c 0300234f 0000001f 0000000c
0205460  00034a58 00034a58 00810012 00000000 0007f97c 0500234f 0000001f 00000014 00034e50 0003504c 00810012 00000000
0205540  ffffffff 02002357 0000002f 00000008 00058bc8 00058bc8 00810037 00000000 0007f9bc 03002357 0000002f 0000000c
0205620  00058cf0 00058cf0 00810037 00000000 0007f9dc 05002357 0000002f 00000014 00058c40 00058cb0 00810037 00000000
0205700  ffffffff 0500236f 00000057 00000014 000939e0 0002438a 00030000 00000000 ffffffff 00002377 0000001f 00000000
0205760  00036c18 00036c18 00810012 00000000 ffffffff 0200237f 0000001f 00000008 00034d38 00034d48 00810012 00000000
0206040  ffffffff 02002387 00000057 00000008 000939e0 0002438a 00030000 00000000 ffffffff 0000239f 0000001f 00000000
0206120  0003af10 0003af10 00810017 00000000 ffffffff 040023cf 0000001f 00000010 00038aa4 00038b78 00810014 00000000
0206200  ffffffff 000023d7 0000001f 00000000 0004a944 0004a944 0081002d 00000000 0007fadc 010023d7 0000001f 00000004
0206260  0004aaa8 0004ab08 0081002d 00000000 ffffffff 040023ff 0000001f 00000010 0004a2cc 0004a2cc 0081002b 00000000
0206340  ffffffff 01002407 00000027 00000004 0004951c 0004951c 00810029 00000000 ffffffff 01002427 0000001f 00000004
0206420  0004c574 0004c5d8 00810030 00000000 ffffffff 0100242f 0000001f 00000004 0003b0c0 0003b0c0 00810017 00000000
0206500  ffffffff 01002477 0000001f 00000004 0003b05c 0003b05c 00810017 00000000 ffffffff 01002487 0000001f 00000004
0206560  000373f0 00037488 00810014 00000000 0007fbbc 02002487 0000001f 00000008 0003b09c 0003b09c 00810017 00000000
0206640  ffffffff 020024a7 0000004f 00000008 000939e0 000a0f6c 0013003a 00000000 ffffffff 020024af 0000004f 00000008
0206720  000939e0 000736ac 0013003a 00000000 ffffffff 020024df 00000057 00000008 000939e0 0002438a 00030000 00000000
0207000  0007fc3c 020024df 0000001f 00000008 000939e0 0002438a 00030020 00000000 ffffffff 010024e7 0000001f 00000004
0207060  0003b03c 0003b03c 00810017 00000000 ffffffff 010024ef 0000001f 00000004 000259d0 000259d0 00810003 00000000
0207140  ffffffff 020024ff 0000001f 00000008 0003a544 0003a5bc 00810017 00000000 ffffffff 01002517 0000004f 00000004
0207220  000939e0 0002438a 00030000 00000000 ffffffff 00002527 0000001f 00000000 0003270c 0003270c 00810010 00000000
0207300  0007fcfc 01002527 0000001f 00000004 000326c0 000326ec 00810010 00000000 ffffffff 0100255f 0000001f 00000004
0207360  00040e5c 00040e5c 00810021 00000000 ffffffff 00002567 00000027 00000000 0004842c 0004842c 00810029 00000000
```

```
0207440 ffffffff 0000256f 0000001f 00000000 0002d2dc 0002d2dc 0081000c 00000000 ffffffff 00002577 0000001f 00000000
0207520 0002d0ec 0002d0ec 0081000c 00000000 ffffffff 0000257f 0000001f 00000000 0003af30 0003af30 00810017 00000000
0207600 ffffffff 01002597 0000001f 00000004 000396a8 000396a8 00810015 00000000 ffffffff 010025b7 00000027 00000004
0207660 00048518 00048518 00810029 00000000 0007fdfc 020025b7 00000027 00000008 00048530 00048530 00810029 00000000
0207740 ffffffff 000025bf 00000027 00000000 00049a98 00048af0 00810029 00000000 ffffffff 000025cf 00000027 00000000
0210020 00048414 00048414 00810029 00000000 ffffffff 010025e7 0000001f 00000004 000396f8 000396f8 00810015 00000000
0210100 ffffffff 020025ef 0000001f 00000008 0003a4c4 0003a518 00810017 00000000 ffffffff 030025f7 0000001f 0000000c
0210160 00033b0c 00033b0c 00810011 00000000 ffffffff 0300264f 0000001f 0000000c 000399cc 00039ab8 00810016 00000000
0210240 ffffffff 0300265f 0000001f 0000000c 00031b0c 00031b0c 00810010 00000000 ffffffff 01002667 0000001f 00000004
0210320 00031b68 00031b68 00810010 00000000 0007e99c 0400266f 0000001f 00000010 0003c17c 0003c17c 00a10018 00000000
0210400 ffffffff 0000267f 0000001f 00000000 0003999c 0003999c 00810015 00000000 ffffffff 02002697 0000001f 00000008
0210460 0003c2ac 0003c2ac 00a10018 00000000 ffffffff 020026bf 0000001f 00000008 000303b4 000303b4 0081000e 00000000
0210540 0007ff9c 030026bf 0000001f 0000000c 000303d0 000303d0 0081000e 00000000 0007ffbc 040026bf 0000001f 00000010
0210620 000303ec 000304cc 0081000e 00000000 ffffffff 010026c7 0000001f 00000004 0003af50 0003af50 00810017 00000000
0210700 ffffffff 010026cf 00002c07 00000004 000939e0 000939e0 00000000 00000000 ffffffff 010026d7 0000001f 00000004
0210760 000344d0 00034570 00810011 00000000 0008003c 030026d7 0000001f 0000000c 000345d4 00034628 00810011 00000000
0211040 ffffffff 030026e7 0000001f 0000000c 00031568 0003d568 0081001a 00000000 ffffffff 040026f7 0000001f 00000010
0211120 00037520 00037520 00810014 00000000 ffffffff 020026ff 0000001f 00000008 0003b5cc 0003b5cc 00810018 00000000
0211200 000800bc 030026ff 0000001f 0000000c 0003b5fc 0003b5fc 00810018 00000000 ffffffff 0100271f 0000001f 00000004
0211260 000442c4 000442c4 00810027 00000000 000800fc 0200271f 0000001f 00000008 000442f4 000442f4 00810027 00000000
0211340 ffffffff 0200273f 0000001f 00000008 0002c44c 0002c44c 0081000c 00000000 0008013c 0300273f 0000001f 0000000c
0211420 0002c468 0002c4b0 0081000c 00000000 ffffffff 02002747 0000001f 00000008 00036c34 00036c34 00810012 00000000
0211500 ffffffff 0200274f 0000001f 00000008 0003ad24 0003ad24 00810017 00000000 ffffffff 01002757 0000001f 00000004
0211560 0003b07c 0003b07c 00810017 00000000 ffffffff 0100275f 0000001f 00000004 0003c3d4 0003c3d4 00a10018 00000000
0211640 000801dc 0200275f 0000001f 00000008 00032618 00032640 00810010 00000000 ffffffff 0100279f 0000001f 00000004
0211720 0003cc4c 0003cc4c 0081001a 00000000 0008021c 0200279f 0000001f 00000008 0003cc6c 0003cc98 0081001a 00000000
0212000 0008023c 0400279f 0000001f 00000010 0003ccc0 0003cd10 0081001a 00000000 ffffffff 030027a7 0000001f 0000000c
0212060 0003cdcc 0003ce0c 0081001a 00000000 ffffffff 010027af 0000001f 00000004 00034958 00034958 00810012 00000000
0212140 ffffffff 030027b7 0000001f 0000000c 00026718 00026718 00810003 00000000 ffffffff 030027bf 0000001f 0000000c
0212220 000267b4 000268c8 00810003 00000000 ffffffff 030027c7 0000001f 0000000c 00026730 00026730 00810003 00000000
0212300 ffffffff 000027d7 0000001f 00000000 00057674 00057674 00810035 00000000 ffffffff 000027df 0000001f 00000000
0212360 00057914 00057914 00810035 00000000 ffffffff 000027ef 0000001f 00000000 0003ae78 0003ae84 00810017 00000000
0212440 ffffffff 010027ff 0000001f 00000004 0003ae04 0003ae04 00810017 00000000 0008037c 020027ff 0000002f 00000008
0212520 00058bb8 00058bb8 00810037 00000000 ffffffff 0000280f 0000001f 00000000 000576a0 000576a0 00810035 00000000
0212600 ffffffff 01002817 0000001f 00000004 00025f2c 00025f80 00810003 00000000 ffffffff 0200281f 0000001f 00000008
0212660 00025fa0 00025fa0 00810003 00000000 ffffffff 01002827 0000001f 00000004 000264cc 0002651c 00810003 00000000
0212740 ffffffff 0200282f 0000001f 00000008 0002653c 0002653c 00810003 00000000 ffffffff 02002837 0000001f 00000008
0213020 0003af70 0003af70 00810017 00000000 ffffffff 0100285f 0000001f 00000004 0003ad80 0003ad80 00810017 00000000
0213100 0008047c 0200285f 0000001f 00000008 0003ad90 0003ad90 00810017 00000000 ffffffff 0100286f 0000001f 00000004
0213160 0003ad40 0003ad40 00810017 00000000 ffffffff 0100288f 0000001f 00000004 00032a24 00032b4c 00810010 00000000
0213240 ffffffff 01002897 0000001f 00000004 00032c10 00032c10 00810010 00000000 ffffffff 0000289f 0000001f 00000000
0213320 00032c44 00032c44 00810010 00000000 0007e47c 010028a7 0000001f 00000004 00032330 00032354 00810010 00000000
0213400 ffffffff 010028b7 0000001f 00000004 00032374 00032398 00810010 00000000 0007e49c 030028bf 0000001f 0000000c
0213460 0003e8f4 0003e8f4 0081001c 00000000 0007e4bc 040028c7 0000004f 00000010 000939e0 0002438a 0013003a 00000000
0213540 0007e4dc 020028cf 0000001f 00000008 00043e94 00043e94 00a10025 00000000 ffffffff 010028ff 0000001f 00000004
0213620 000329f4 000329f4 00810010 00000000 000805dc 020028ff 0000001f 00000008 00032984 000329cc 00810010 00000000
0213700 0007e5dc 02002927 0000001f 00000008 00027328 00027364 00810004 00000000 0008061c 04002927 0000001f 00000010
0213760 00027388 00027448 00810004 00000000 ffffffff 01002937 0000001f 00000004 0003f64c 0003f64c 0081001d 00000000
0214040 0008065c 02002937 0000001f 00000008 0003f670 0003f670 0081001d 00000000 0008067c 04002937 0000001f 00000010
0214120 0003f6dc 0003f720 0081001d 00000000 ffffffff 0200293f 00000057 00000008 000939e0 0009ca88 00030000 00000000
0214200 ffffffff 01002957 00000027 00000004 000484dc 000484dc 00810029 00000000 000806dc 02002957 00000027 00000008
0214260 000484f4 000484f4 00810029 00000000 000806fc 03002957 00000027 0000000c 0004857c 000485f4 00810029 00000000
0214340 ffffffff 00002997 0000001f 00000000 000403c8 000403c8 0081001f 00000000 0008073c 02002997 0000001f 00000008
0214420 0004020c 0004020c 0081001f 00000000 ffffffff 020029af 0000001f 00000008 00055034 00055034 00810032 00000000
0214500 ffffffff 020029bf 0000001f 00000008 00033220 00033220 00810010 00000000 ffffffff 020029c7 0000001f 00000008
```

```
0214560 0003250c 0003250c 00810010 00000000 000807bc 030029c7 0000001f 0000000c 00033398 00033410 00810010 00000000
0214640 ffffffff 010029ef 0000001f 00000004 00040e4c 00040e4c 00810021 00000000 ffffffff 010029f7 00000027 00000004
0214720 00047f28 00047f28 00810029 00000000 ffffffff 020029ff 0000001f 00000008 0003ae3c 0003ae3c 00810017 00000000
0215000 ffffffff 02002a17 0000001f 00000008 0003cb84 0003cb84 00a10019 00000000 ffffffff 01002a27 0000001f 00000004
0215060 000327ec 000327ec 00810010 00000000 0008087c 02002a27 0000001f 00000008 00032790 000327c4 00810010 00000000
0215140 ffffffff 01002a37 0000001f 00000004 00032c64 00032dac 00810010 00000000 0007e61c 01002a3f 0000001f 00000004
0215220 00032e70 00032e70 00810010 00000000 ffffffff 02002a5f 00002c07 00000008 000939e0 0009f230 00030000 00000000
0215300 ffffffff 00002a97 0000001f 00000000 00032ea4 00032ea4 00810010 00000000 0007ea3c 00002abf 00000027 00000000
0215360 00048444 00048444 00810029 00000000 0008093c 08002abf 00000027 00000020 00046020 000461f8 00810029 00000000
0215440 0007ea7c 03002acf 0000001f 0000000c 0004294c 00042c50 00810025 00000000 ffffffff 00002af7 0000001f 00000000
0215520 0003c6bc 0003c6bc 00a10018 00000000 ffffffff 00002aff 0000001f 00000000 0003997c 0003997c 00810015 00000000
0215600 0007ea9c 01002b0f 0000001f 00000004 000379a4 000379a4 00810014 00000000 000809dc 02002b0f 0000001f 00000008
0215660 000379f0 000379f0 00810014 00000000 0007eabc 00002b17 0000001f 00000000 00033020 00033020 00810010 00000000
0215740 ffffffff 01002b1f 0000001f 00000004 00032f90 00032f90 00810010 00000000 ffffffff 01002b27 0000001f 00000004
0216020 00032fa8 00032fa8 00810010 00000000 ffffffff 00002b2f 0000001f 00000000 00032ff0 00032ff0 00810010 00000000
0216100 ffffffff 01002b37 0000001f 00000004 00033008 00033008 00810010 00000000 0007eadc 01002b3f 0000001f 00000004
0216160 00032fc0 00032fc0 00810010 00000000 0007eafc 01002b47 0000001f 00000004 00032fd8 00032fd8 00810010 00000000
0216240 0007eb1c 01002b4f 0000004f 00000004 000939e0 0009a9cc 00030000 00000000 ffffffff 01002bbf 0000001f 00000004
0216320 00043f08 00043f2c 00810026 00000000 ffffffff 02002bc7 0000001f 00000008 0002d15c 0002d1a8 0081000c 00000000
0216400 ffffffff 03002bcf 00002c07 0000000c 000939e0 000939e0 00000000 00000000 ffffffff 01002bf7 0000001f 00000004
0216460 00034980 00034980 00810012 00000000 00080b7c 02002bf7 0000001f 00000008 00034998 000349b8 00810012 00000000
0216540 00080b9c 03002bf7 0000001f 0000000c 000349c8 00034a04 00810012 00000000 ffffffff 04002c17 00002c07 00000010
0216620 000939e0 000939e0 00000000 00000000 0007ecdc 00002c1f 00002c07 00000000 000939e0 000939e0 00000000 00000000
0216700 ffffffff 01002c37 0000004f 00000004 000939e0 0009a520 0013003a 00000000 ffffffff 03002c3f 0000005f 0000000c
0216760 000939e0 0006f464 00030013 00000000 ffffffff 01002c57 0000001f 00000004 00039698 00039698 00810015 00000000
0217040 ffffffff 00002c87 0000001f 00000000 0003b138 0003b200 00810017 00000000 00080c7c 01002c87 0000001f 00000004
0217120 0003b20c 0003b234 00810017 00000000 ffffffff 01002c8f 0000001f 00000004 00044168 00044168 00810026 00000000
0217200 00080cbc 02002c8f 0000001f 00000008 00044188 00044188 00810026 00000000 ffffffff 01002cef 0000001f 00000004
0217260 000441cc 000441cc 00810027 00000000 00080cfc 02002cef 0000001f 00000008 000441fc 000441fc 00810027 00000000
0217340 ffffffff 01002d07 0000001f 00000004 00027f38 00027f38 00810007 00000000 00080d3c 02002d07 0000001f 00000008
0217420 00027f50 00027f80 00810007 00000000 0307e6dc 01002d0f 0000001f 00000004 00044248 00044248 00810027 00000000
0217500 00080d7c 02002d0f 0000001f 00000008 00044278 00044278 00810027 00000000 0007ec1c 04002d1f 00000057 00000010
0217560 000939e0 0002438a 00030000 00000000 0005d562 01ffffff 0005aa98 01ffffff 0006170a 00000000 0006170a 01ffffff
0217640 0006170a 01ffffff 0006170a 01ffffff 0006170a 01ffffff 0006170a 01ffffff 0006170a 01ffffff 0006170a 01ffffff
0217720 0006170a 01ffffff 0006170a 01ffffff 0006170a 01ffffff 0006170a 01ffffff 0006170a 01ffffff 0006170a 01ffffff
0220000 0006170a 00000000 0006170a 00000000 0006170a 00000000 0006170a 00000000 0006170a 00000000 0006170a 00000000
*
0223060 0006170a 00000000 0006170a 00000000 0006170a 00000000 0006170a 00000000 0006170a 00000000 0005a0ca 01ffffff
0223140 0005a0ce 01ffffff 0005a0d4 01ffffff 0005a0dc 01ffffff 0005a102 01ffffff 0005a14a 010000df 0005a194 01ffffff
0223220 0005a1ec 01ffffff 0005a1fc 01ffffff 0005a226 01ffffff 0005a26c 01ffffff 0005a2ae 01ffffff 0005a2d8 01ffffff
0223300 0005a2fe 010000e7 0005a324 01ffffff 0005a356 01ffffff 0005a39a 010000ea 0005a3dc 010000eb 0005a420 01ffffff
0223360 0005a46a 01ffffff 0005a4b4 01ffffff 0005a4fc 01ffffff 0005a544 01ffffff 0005a592 01ffffff 0005a5ac 01ffffff
0223440 0005a5b2 01ffffff 0005a5c0 01ffffff 0005a5ce 01ffffff 0005a5e0 01ffffff 0005a5f4 01ffffff 0005a5fe 01ffffff
0223520 0005a604 01ffffff 0005a60a 01ffffff 0005a610 01ffffff 0005a618 010000f8 0005a622 01ffffff 0005a66e 01ffffff
0223600 0005a674 01ffffff 0005a67a 01ffffff 0005a680 01ffffff 0005a688 01ffffff 0005a696 01ffffff 0005a6a4 01ffffff
0223660 0005a6b4 01ffffff 0005a6be 01ffffff 0005a6c2 01ffffff 0005a712 01ffffff 0005a716 01ffffff 0005a71c 01ffffff
0223740 0005a722 01ffffff 0005a72a 01ffffff 0005a732 01ffffff 0005a738 01ffffff 0005a77c 01ffffff 0005a780 01ffffff
0224020 0005a784 01ffffff 0005a794 01ffffff 0005a7a2 01ffffff 0005a7bc 01ffffff 0005a7d0 01ffffff 0005a7e8 01ffffff
0224100 0005a800 01ffffff 0005a812 01ffffff 0005a834 01ffffff 0005a84c 01ffffff 0005a864 01ffffff 0005a878 01ffffff
0224160 0005a88a 01ffffff 0005a898 01ffffff 0005a8a0 01ffffff 0005a8a8 01ffffff 0005a8b4 01ffffff 0005a8c2 01ffffff
0224240 0005a8ce 01ffffff 0005a8e2 01ffffff 0005a8f6 01ffffff 0005a8fe 01ffffff 0005a904 01ffffff 0005a918 01ffffff
0224320 0005a924 01ffffff 0005a92c 01ffffff 0005a936 01ffffff 0005a94a 01ffffff 0005a95a 01ffffff 0005a95e 01ffffff
0224400 0005a962 01ffffff 0005a968 01ffffff 0005a96c 01ffffff 0005a976 01ffffff 0005a982 01ffffff 0005a990 01000121
0224460 0005a99c 01ffffff 0005a9aa 01ffffff 0005a9b6 01ffffff 0005a9c2 01ffffff 0005a9cc 0100010b 0005a9da 01ffffff
0224540 0005a9e4 01ffffff 0005a9f2 01ffffff 0005a9fe 01ffffff 0005aa12 01ffffff 0005aa16 01ffffff 0005aa1a 01000100
```

| | | | | | | | | | | | | |
|---|---|---|---|---|---|---|---|---|---|---|---|---|
| 0224620 | 0005aa20 | 010000f7 | 0005aa38 | 01ffffff | 0005aa4c | 01ffffff | 0005aa5a | 01ffffff | 0005aa60 | 01ffffff | 0005aa64 | 01ffffff |
| 0224700 | 0005aa68 | 01ffffff | 0005aa6e | 01ffffff | 0005aa76 | 01ffffff | 0005aa7a | 01ffffff | 0005aa80 | 01ffffff | 0005aa86 | 01ffffff |
| 0224760 | 0005aa8c | 01ffffff | 0005aa92 | 01ffffff | 0005aa9c | 01ffffff | 0005aaa2 | 01ffffff | 0005aaaa | 01ffffff | 0005aab0 | 01ffffff |
| 0225040 | 0005aab8 | 01ffffff | 0005aabe | 01ffffff | 0005aac4 | 01ffffff | 0005aaca | 01ffffff | 0005aace | 01ffffff | 0005aad4 | 01000109 |
| 0225120 | 0005ab06 | 01ffffff | 0005ab0c | 01ffffff | 0005ab12 | 01ffffff | 0005ab44 | 01ffffff | 0005ab74 | 01ffffff | 0005aba6 | 01ffffff |
| 0225200 | 0005abd8 | 01ffffff | 0005ac0c | 01ffffff | 0005ac3c | 01ffffff | 0005ac6e | 01ffffff | 0005ac9e | 01ffffff | 0005acd0 | 01ffffff |
| 0225260 | 0005ad04 | 01ffffff | 0005ad36 | 01ffffff | 0005ad66 | 01ffffff | 0005ad96 | 0100015d | 0005adc8 | 01ffffff | 0005adf8 | 01ffffff |
| 0225340 | 0005ae28 | 01ffffff | 0005ae58 | 01ffffff | 0005ae8a | 01ffffff | 0005aeb8 | 01ffffff | 0005aeec | 01ffffff | 0005af18 | 01ffffff |
| 0225420 | 0005af4a | 01000114 | 0005af7c | 01ffffff | 0005afac | 01ffffff | 0005afdc | 01ffffff | 0005b00e | 01000155 | 0005b03c | 010000f0 |
| 0225500 | 0005b070 | 01ffffff | 0005b0a2 | 01ffffff | 0005b0d2 | 0100016b | 0005b102 | 01000165 | 0005b136 | 01ffffff | 0005b16c | 01ffffff |
| 0225560 | 0005b1a0 | 01ffffff | 0005b1d4 | 01ffffff | 0005b20a | 01ffffff | 0005b23c | 01000179 | 0005b270 | 01ffffff | 0005b2a0 | 01ffffff |
| 0225640 | 0005b2ce | 01ffffff | 0005b300 | 0100017a | 0005b332 | 01ffffff | 0005b362 | 01ffffff | 0005b392 | 01ffffff | 0005b3c4 | 01000188 |
| 0225720 | 0005b3f4 | 01ffffff | 0005b428 | 01ffffff | 0005b45c | 0100010a | 0005b490 | 01000175 | 0005b4c4 | 01ffffff | 0005b4f4 | 01ffffff |
| 0226000 | 0005b526 | 01ffffff | 0005b559 | 01ffffff | 0005b58c | 01ffffff | 0005b5ba | 01ffffff | 0005b5ec | 01ffffff | 0005b61a | 01ffffff |
| 0226060 | 0005b64a | 01ffffff | 0005b652 | 01ffffff | 0005b65c | 01ffffff | 0005b662 | 01ffffff | 0005b6a4 | 01ffffff | 0005b6cc | 010000e3 |
| 0226140 | 0005b6d0 | 01ffffff | 0005b6d6 | 01ffffff | 0005b702 | 01ffffff | 0005b73c | 01ffffff | 0005b790 | 01ffffff | 0005b796 | 01ffffff |
| 0226220 | 0005b79a | 01ffffff | 0005b79e | 01ffffff | 0005b7a4 | 01ffffff | 0005b7a8 | 01ffffff | 0005b7ae | 01ffffff | 0005b7b4 | 01ffffff |
| 0226300 | 0005b7ba | 01ffffff | 0005b7c0 | 01ffffff | 0005b7c6 | 01ffffff | 0005b7ca | 01ffffff | 0005b7d0 | 0100015b | 0005b7d6 | 01ffffff |
| 0226360 | 0005b7da | 01ffffff | 0005b7e0 | 01ffffff | 0005b7e6 | 01ffffff | 0005b7ec | 01ffffff | 0005b7f2 | 01ffffff | 0005b7f8 | 01000158 |
| 0226440 | 0005b82e | 01ffffff | 0005b832 | 01ffffff | 0005b83a | 01ffffff | 0005b850 | 01ffffff | 0005b882 | 01ffffff | 0005b89a | 010001b8 |
| 0226520 | 0005b8b2 | 01ffffff | 0005b8dc | 01ffffff | 0005b902 | 01ffffff | 0005b930 | 01000156 | 0005b95e | 01ffffff | 0005b98a | 01ffffff |
| 0226600 | 0005b9b2 | 010001bc | 0005b9dc | 01ffffff | 0005ba06 | 01000103 | 0005ba36 | 01ffffff | 0005ba5e | 01ffffff | 0005ba84 | 0100011d |
| 0226660 | 0005bab2 | 01ffffff | 0005bb00 | 010001b5 | 0005bb16 | 01ffffff | 0005bb3a | 01ffffff | 0005bb42 | 01ffffff | 0005bb4a | 01ffffff |
| 0226740 | 0005bb78 | 01ffffff | 0005bbba | 01ffffff | 0005bc0a | 01ffffff | 0005bc56 | 01ffffff | 0005bc84 | 01ffffff | 0005bcb2 | 010001d0 |
| 0227020 | 0005bce6 | 010001d1 | 0005bd12 | 010001d2 | 0005bd42 | 01ffffff | 0005bd7e | 01ffffff | 0005bdc4 | 01ffffff | 0005be08 | 01ffffff |
| 0227100 | 0005be3e | 010001d5 | 0005be7a | 01ffffff | 0005bec0 | 01ffffff | 0005bf04 | 010001d8 | 0005bf4a | 01ffffff | 0005bf90 | 010001db |
| 0227160 | 0005bfc6 | 01ffffff | 0005c00c | 01ffffff | 0005c04c | 010001df | 0005c08c | 010001dd | 0005c0d4 | 010000fb | 0005c12e | 01ffffff |
| 0227240 | 0005c15e | 01ffffff | 0005c19e | 01ffffff | 0005c1de | 010001e4 | 0005c208 | 01000115 | 0005c238 | 0100018d | 0005c282 | 010001e8 |
| 0227320 | 0005c2d0 | 01ffffff | 0005c316 | 01ffffff | 0005c348 | 010001eb | 0005c37e | 01ffffff | 0005c3b0 | 010001e1 | 0005c3fa | 010001de |
| 0227400 | 0005c438 | 010001da | 0005c48a | 01ffffff | 0005c4ba | 01ffffff | 0005c4ee | 01ffffff | 0005c4f6 | 01ffffff | 0005c516 | 01ffffff |
| 0227460 | 0005c534 | 01ffffff | 0005c552 | 01ffffff | 0005c572 | 01ffffff | 0005c5d6 | 0100013e | 0005c5e0 | 01ffffff | 0005c614 | 010001e7 |
| 0227540 | 0005c636 | 01ffffff | 0005c63c | 0100018a | 0005c646 | 01ffffff | 0005c690 | 01ffffff | 0005c69c | 01ffffff | 0005c6a4 | 01ffffff |
| 0227620 | 0005c6aa | 01ffffff | 0005c6b2 | 01ffffff | 0005c6d8 | 01ffffff | 0005c71e | 01ffffff | 0005c73a | 01ffffff | 0005c73e | 01ffffff |
| 0227700 | 0005c74a | 01ffffff | 0005c756 | 01ffffff | 0005c762 | 01ffffff | 0005c76e | 01ffffff | 0005c77a | 01ffffff | 0005c786 | 01ffffff |
| 0227760 | 0005c792 | 01ffffff | 0005c79e | 01ffffff | 0005c7aa | 01ffffff | 0005c7b6 | 01000209 | 0005c7c2 | 0100020a | 0005c7ce | 0100020b |
| 0230040 | 0005c7da | 0100020c | 0005c7e6 | 0100020d | 0005c7f2 | 0100020e | 0005c7fe | 0100020f | 0005c80a | 01000210 | 0005c816 | 01ffffff |
| 0230120 | 0005c822 | 01ffffff | 0005c82e | 01000213 | 0005c83a | 01000214 | 0005c846 | 01000215 | 0005c852 | 01000216 | 0005c85e | 01000217 |
| 0230200 | 0005c86a | 01000218 | 0005c876 | 01000219 | 0005c882 | 0100021a | 0005c88e | 01ffffff | 0005c89a | 01ffffff | 0005c8a6 | 0100021d |
| 0230260 | 0005c8b2 | 0100021e | 0005c8be | 0100021f | 0005c8ca | 01000220 | 0005c8d6 | 01000221 | 0005c8e2 | 01000222 | 0005c8ee | 01000223 |
| 0230340 | 0005c8fa | 01000224 | 0005c906 | 01ffffff | 0005c912 | 01ffffff | 0005c91e | 01000227 | 0005c92a | 01000228 | 0005c936 | 01000229 |
| 0230420 | 0005c942 | 0100022a | 0005c94e | 0100022b | 0005c95a | 0100022c | 0005c966 | 0100022d | 0005c972 | 0100022e | 0005c97e | 01ffffff |
| 0230500 | 0005c98a | 01ffffff | 0005c996 | 01000231 | 0005c9a2 | 01000232 | 0005c9ae | 01000233 | 0005c9ba | 01000234 | 0005c9c6 | 01000235 |
| 0230560 | 0005c9d2 | 01000236 | 0005c9de | 01000237 | 0005c9ea | 01000238 | 0005c9f6 | 01ffffff | 0005ca02 | 01ffffff | 0005ca0e | 0100023b |
| 0230640 | 0005ca1a | 0100023c | 0005ca26 | 0100023d | 0005ca32 | 0100023e | 0005ca3e | 0100023f | 0005ca4a | 01000240 | 0005ca56 | 01000241 |
| 0230720 | 0005ca62 | 01000242 | 0005ca6e | 01ffffff | 0005ca7a | 01ffffff | 0005ca86 | 01000245 | 0005ca92 | 01000246 | 0005ca9e | 01000247 |
| 0231000 | 0005caaa | 01000248 | 0005cab6 | 01000249 | 0005cac2 | 0100024a | 0005cace | 0100024b | 0005cada | 0100024c | 0005cae6 | 01ffffff |
| 0231060 | 0005caf2 | 01ffffff | 0005cafe | 0100024f | 0005cb0a | 01000250 | 0005cb16 | 01000251 | 0005cb22 | 01000252 | 0005cb2e | 01000253 |
| 0231140 | 0005cb3a | 01000254 | 0005cb46 | 01000255 | 0005cb52 | 01000256 | 0005cb5e | 01ffffff | 0005cb6a | 01ffffff | 0005cb76 | 01000259 |
| 0231220 | 0005cb82 | 0100025a | 0005cb8e | 0100025b | 0005cb9a | 0100025c | 0005cba6 | 0100025d | 0005cbb2 | 0100025e | 0005cbbe | 0100025f |
| 0231300 | 0005cbca | 01000260 | 0005cbd6 | 01ffffff | 0005cbe2 | 01ffffff | 0005cbee | 0100021b | 0005cbfa | 0100021c | 0005cc06 | 01000225 |
| 0231360 | 0005cc12 | 01000226 | 0005cc1e | 0100022f | 0005cc2a | 01000230 | 0005cc36 | 01000239 | 0005cc42 | 0100023a | 0005cc4e | 01000243 |
| 0231440 | 0005cc5a | 01000244 | 0005cc66 | 0100026d | 0005cc72 | 0100026e | 0005cc7e | 0100026f | 0005cc8a | 01000270 | 0005cc96 | 01000271 |
| 0231520 | 0005cca2 | 01000272 | 0005ccae | 01000273 | 0005ccba | 01000274 | 0005ccc6 | 0100024d | 0005ccd2 | 0100024e | 0005ccde | 01000277 |
| 0231600 | 0005ccea | 01000278 | 0005ccf6 | 01000279 | 0005cd02 | 0100027a | 0005cd0e | 0100027b | 0005cd1a | 0100027c | 0005cd26 | 0100027d |
| 0231660 | 0005cd32 | 0100027e | 0005cd3e | 01000257 | 0005cd4a | 01000258 | 0005cd56 | 01000281 | 0005cd62 | 01ffffff | 0005cd8a | 0100028a |

| | | | | | | | | | | | | |
|---|---|---|---|---|---|---|---|---|---|---|---|---|
| 0231740 | 0005cdb2 | 0100028b | 0005cdda | 010001c5 | 0005ce0c | 01ffffff | 0005ce14 | 01ffffff | 0005ce1c | 01ffffff | 0005ce32 | 01ffffff |
| 0232020 | 0005ce4a | 01ffffff | 0005ce58 | 01000205 | 0005ce6c | 01ffffff | 0005ce94 | 01ffffff | 0005cec6 | 01ffffff | 0005cefc | 01ffffff |
| 0232100 | 0005cf0c | 01ffffff | 0005cf4c | 01ffffff | 0005cf6e | 01ffffff | 0005cf96 | 01ffffff | 0005cfb0 | 01000299 | 0005cfca | 01ffffff |
| 0232160 | 0005d00e | 01000293 | 0005d022 | 01ffffff | 0005d062 | 01ffffff | 0005d09e | 01ffffff | 0005d0d4 | 01ffffff | 0005d116 | 010002a0 |
| 0232240 | 0005d150 | 01ffffff | 0005d15a | 01ffffff | 0005d184 | 01ffffff | 0005d1a8 | 01ffffff | 0005d1ac | 010000e9 | 0005d1c4 | 010001c9 |
| 0232320 | 0005d1d6 | 01ffffff | 0005d1f2 | 01ffffff | 0005d204 | 01ffffff | 0005d236 | 01ffffff | 0005d23e | 01ffffff | 0005d25a | 01ffffff |
| 0232400 | 0005d268 | 01ffffff | 0005d278 | 01ffffff | 0005d2a6 | 01000126 | 0005d2cc | 010002b1 | 0005d2e8 | 01ffffff | 0005d306 | 010002b4 |
| 0232460 | 0005d324 | 010001f2 | 0005d356 | 01ffffff | 0005d37a | 010002ac | 0005d392 | 01ffffff | 0005d3a4 | 01000297 | 0005d3b6 | 010000ec |
| 0232540 | 0005d3dc | 01ffffff | 0005d400 | 010001fa | 0005d442 | 01ffffff | 0005d46e | 01ffffff | 0005d49e | 01ffffff | 0005d4d2 | 01ffffff |
| 0232620 | 0005d502 | 01ffffff | 0005d53a | 01ffffff | 0005d568 | 01ffffff | 0005d58a | 01ffffff | 0005d5ae | 010002b5 | 0005d5c4 | 01ffffff |
| 0232700 | 0005d5c8 | 01ffffff | 0005d5ce | 01ffffff | 0005d5d4 | 01ffffff | 0005d5da | 01ffffff | 0005d5de | 01ffffff | 0005d5e4 | 01ffffff |
| 0232760 | 0005d5e8 | 01ffffff | 0005d626 | 0100018f | 0005d666 | 010001a4 | 0005d674 | 01ffffff | 0005d684 | 01ffffff | 0005d696 | 0100011c |
| 0233040 | 0005d6a6 | 01ffffff | 0005d6b6 | 01000206 | 0005d6c2 | 01ffffff | 0005d6ce | 01ffffff | 0005d6dc | 01000187 | 0005d6ee | 01ffffff |
| 0233120 | 0005d700 | 01ffffff | 0005d710 | 01ffffff | 0005d720 | 01ffffff | 0005d734 | 01ffffff | 0005d74a | 01ffffff | 0005d75a | 0100029e |
| 0233200 | 0005d76a | 010002de | 0005d780 | 01ffffff | 0005d794 | 0100029d | 0005d7a6 | 01ffffff | 0005d7b0 | 01ffffff | 0005d7c8 | 01ffffff |
| 0233260 | 0005d7da | 01000110 | 0005d7ec | 010002e5 | 0005d7fe | 01ffffff | 0005d810 | 01ffffff | 0005d820 | 01ffffff | 0005d830 | 01ffffff |
| 0233340 | 0005d840 | 01ffffff | 0005d854 | 01ffffff | 0005d86e | 010002ed | 0005d882 | 0100013a | 0005d892 | 010002e0 | 0005d8ac | 010002f0 |
| 0233420 | 0005d8c4 | 01ffffff | 0005d8dc | 010002e2 | 0005d8ec | 01000194 | 0005d8f4 | 01ffffff | 0005d8fe | 01ffffff | 0005d914 | 01ffffff |
| 0233500 | 0005d920 | 01ffffff | 0005d930 | 01ffffff | 0005d942 | 01ffffff | 0005d952 | 01ffffff | 0005d960 | 01ffffff | 0005d974 | 010000e6 |
| 0233560 | 0005d984 | 010002e8 | 0005d996 | 01ffffff | 0005d9a8 | 01ffffff | 0005d9c2 | 010002ba | 0005d9ca | 01ffffff | 0005d9d8 | 010002e4 |
| 0233640 | 0005d9ec | 010002fc | 0005da00 | 01000119 | 0005da1a | 010002f3 | 0005da2e | 01ffffff | 0005da3a | 010002ec | 0005da4c | 010002ee |
| 0233720 | 0005da64 | 01000309 | 0005da76 | 01ffffff | 0005da86 | 01ffffff | 0005da96 | 01ffffff | 0005daaa | 0100019b | 0005dab8 | 01ffffff |
| 0234000 | 0005dac6 | 010001f1 | 0005dad6 | 010002df | 0005daec | 01ffffff | 0005daf8 | 010000f9 | 0005db08 | 01ffffff | 0005db18 | 01ffffff |
| 0234060 | 0005db2c | 01ffffff | 0005db38 | 01ffffff | 0005db4a | 01ffffff | 0005db5c | 01ffffff | 0005db66 | 01ffffff | 0005db76 | 0100030a |
| 0234140 | 0005db86 | 010001a5 | 0005db96 | 01ffffff | 0005dba6 | 0100011a | 0005dbb2 | 01ffffff | 0005dbc2 | 01ffffff | 0005dbd2 | 01ffffff |
| 0234220 | 0005dbe2 | 010002f5 | 0005dbf4 | 010000fa | 0005dc0a | 010002e9 | 0005dc1c | 01ffffff | 0005dc24 | 01ffffff | 0005dc2e | 01ffffff |
| 0234300 | 0005dc3a | 01000310 | 0005dc50 | 010002fa | 0005dc5e | 01ffffff | 0005dc6e | 01ffffff | 0005dc80 | 01ffffff | 0005dc92 | 01ffffff |
| 0234360 | 0005dca4 | 01ffffff | 0005dcb4 | 01ffffff | 0005dcc4 | 010002f8 | 0005dcd4 | 01ffffff | 0005dce2 | 01ffffff | 0005dcec | 01ffffff |
| 0234440 | 0005dcfc | 010002cb | 0005dd10 | 01ffffff | 0005dd20 | 010002ab | 0005dd2e | 01ffffff | 0005dd3e | 01ffffff | 0005dd4e | 010001a2 |
| 0234520 | 0005dd5a | 01ffffff | 0005dd6a | 0100028f | 0005dd78 | 010002f1 | 0005dd8e | 01000328 | 0005dd9e | 01ffffff | 0005ddae | 01ffffff |
| 0234600 | 0005ddbe | 01ffffff | 0005ddd4 | 01ffffff | 0005dde4 | 01000306 | 0005ddf6 | 01ffffff | 0005de02 | 01000276 | 0005de10 | 010002f4 |
| 0234660 | 0005de1e | 01000304 | 0005de32 | 01ffffff | 0005de3e | 01ffffff | 0005de4a | 01ffffff | 0005de56 | 01ffffff | 0005de62 | 01ffffff |
| 0234740 | 0005de6e | 01ffffff | 0005de7a | 01ffffff | 0005de86 | 010002db | 0005de98 | 01ffffff | 0005dea2 | 01ffffff | 0005deb2 | 01ffffff |
| 0235020 | 0005deca | 0100033d | 0005dee4 | 01ffffff | 0005def0 | 01ffffff | 0005def4 | 01ffffff | 0005defe | 0100016f | 0005df06 | 01ffffff |
| 0235100 | 0005df18 | 010001af | 0005df22 | 010001b4 | 0005df38 | 01ffffff | 0005df42 | 01ffffff | 0005df4a | 01ffffff | 0005df54 | 01ffffff |
| 0235160 | 0005df5c | 01ffffff | 0005df6c | 01000338 | 0005df72 | 01ffffff | 0005df80 | 01ffffff | 0005df92 | 01ffffff | 0005df9e | 01ffffff |
| 0235240 | 0005dfa4 | 01ffffff | 0005dfb0 | 010001ff | 0005dfc2 | 01ffffff | 0005dfd2 | 0100017f | 0005dfdc | 01ffffff | 0005dfe4 | 01ffffff |
| 0235320 | 0005dff8 | 01ffffff | 0005e00a | 010002eb | 0005e010 | 01ffffff | 0005e018 | 01ffffff | 0005e020 | 0100033c | 0005e02a | 010002a2 |
| 0235400 | 0005e034 | 01ffffff | 0005e03e | 01ffffff | 0005e054 | 01ffffff | 0005e05c | 01ffffff | 0005e072 | 01ffffff | 0005e080 | 01ffffff |
| 0235460 | 0005e08a | 0100019f | 0005e0ca | 01ffffff | 0005e0fa | 01000376 | 0005e138 | 01000378 | 0005e172 | 01000379 | 0005e1aa | 01ffffff |
| 0235540 | 0005e1b4 | 01ffffff | 0005e1be | 01ffffff | 0005e1c6 | 01ffffff | 0005e1d0 | 01ffffff | 0005e1de | 01ffffff | 0005e1e6 | 01ffffff |
| 0235620 | 0005e1f6 | 010002f7 | 0005e1fe | 010000ed | 0005e206 | 01ffffff | 0005e218 | 01ffffff | 0005e21e | 01ffffff | 0005e248 | 010002e1 |
| 0235700 | 0005e254 | 01ffffff | 0005e25e | 01ffffff | 0005e268 | 01000343 | 0005e270 | 01ffffff | 0005e274 | 01000301 | 0005e27c | 01ffffff |
| 0235760 | 0005e288 | 01000335 | 0005e2ca | 01ffffff | 0005e2d6 | 01ffffff | 0005e2f6 | 010001fb | 0005e326 | 01ffffff | 0005e366 | 01ffffff |
| 0236040 | 0005e384 | 010002d3 | 0005e39c | 01ffffff | 0005e3b8 | 01ffffff | 0005e3ea | 01ffffff | 0005e3fc | 01ffffff | 0005e40e | 01ffffff |
| 0236120 | 0005e414 | 01ffffff | 0005e426 | 01ffffff | 0005e42c | 010002bc | 0005e432 | 01ffffff | 0005e442 | 01ffffff | 0005e44a | 010001e9 |
| 0236200 | 0005e45c | 01ffffff | 0005e470 | 01ffffff | 0005e49e | 01ffffff | 0005e4a6 | 01ffffff | 0005e4b0 | 01ffffff | 0005e4d8 | 01ffffff |
| 0236260 | 0005e4ea | 01ffffff | 0005e4f2 | 01ffffff | 0005e4fa | 010001f4 | 0005e504 | 010001b0 | 0005e50e | 01ffffff | 0005e518 | 01ffffff |
| 0236340 | 0005e524 | 01ffffff | 0005e530 | 01ffffff | 0005e538 | 01ffffff | 0005e544 | 01ffffff | 0005e54e | 01ffffff | 0005e55a | 01ffffff |
| 0236420 | 0005e566 | 01ffffff | 0005e56e | 010001c3 | 0005e578 | 01000212 | 0005e588 | 01ffffff | 0005e59a | 01ffffff | 0005e5ac | 01ffffff |
| 0236500 | 0005e5bc | 01ffffff | 0005e5ca | 01ffffff | 0005e5dc | 01ffffff | 0005e5ea | 01ffffff | 0005e5fc | 01000303 | 0005e610 | 01ffffff |
| 0236560 | 0005e622 | 01ffffff | 0005e628 | 0100018c | 0005e62c | 01ffffff | 0005e634 | 010000f1 | 0005e640 | 010002af | 0005e654 | 01ffffff |
| 0236640 | 0005e65c | 01000116 | 0005e66a | 01ffffff | 0005e676 | 01ffffff | 0005e67e | 01ffffff | 0005e68a | 01ffffff | 0005e69a | 01ffffff |
| 0236720 | 0005e6a4 | 0100031b | 0005e6ba | 01ffffff | 0005e6ca | 01ffffff | 0005e6d2 | 01ffffff | 0005e6dc | 0100033f | 0005e6e2 | 01ffffff |
| 0237000 | 0005e6f2 | 01000326 | 0005e6fc | 01ffffff | 0005e70c | 01ffffff | 0005e71a | 01ffffff | 0005e72a | 01ffffff | 0005e732 | 01ffffff |

| | | | | | | | | | | | | |
|---|---|---|---|---|---|---|---|---|---|---|---|---|
| 0237060 | 0005e744 | 01ffffff | 0005e756 | 01ffffff | 0005e766 | 01ffffff | 0005e76e | 01000357 | 0005e780 | 01ffffff | 0005e78c | 01ffffff |
| 0237140 | 0005e7ae | 010002ae | 0005e7b6 | 01ffffff | 0005e7c4 | 01ffffff | 0005e7d0 | 01000141 | 0005e7e6 | 01ffffff | 0005e7f2 | 01ffffff |
| 0237220 | 0005e7f6 | 01000139 | 0005e7fe | 01ffffff | 0005e80c | 01ffffff | 0005e82e | 01ffffff | 0005e84c | 0100014a | 0005e874 | 01ffffff |
| 0237300 | 0005e88c | 01ffffff | 0005e8b0 | 01ffffff | 0005e8b8 | 01ffffff | 0005e8c2 | 01ffffff | 0005e8cc | 0100036c | 0005e8d4 | 010003b9 |
| 0237360 | 0005e8e6 | 01000176 | 0005e8fa | 01ffffff | 0005e908 | 010002a3 | 0005e910 | 010002f9 | 0005e922 | 01ffffff | 0005e93a | 01000262 |
| 0237440 | 0005e94c | 01ffffff | 0005e956 | 01ffffff | 0005e95e | 010003d9 | 0005e970 | 01000137 | 0005e978 | 01ffffff | 0005e97e | 0100031d |
| 0237520 | 0005e98e | 01ffffff | 0005e9ca | 01ffffff | 0005e9d2 | 01ffffff | 0005e9dc | 01ffffff | 0005e9e8 | 010003d4 | 0005e9f2 | 01ffffff |
| 0237600 | 0005ea02 | 010003d7 | 0005ea1a | 01ffffff | 0005ea2c | 01ffffff | 0005ea36 | 010001b9 | 0005ea40 | 010000dc | 0005ea4c | 01ffffff |
| 0237660 | 0005ea54 | 01ffffff | 0005ea5e | 01ffffff | 0005ea64 | 01000341 | 0005ea6a | 01ffffff | 0005ea9c | 01ffffff | 0005eae0 | 01ffffff |
| 0237740 | 0005eaf2 | 01000371 | 0005eb08 | 01ffffff | 0005eb0e | 01ffffff | 0005eb1e | 01ffffff | 0005eb30 | 01ffffff | 0005eb3c | 010003f6 |
| 0240020 | 0005eb4e | 01ffffff | 0005eb5a | 01ffffff | 0005eb64 | 01ffffff | 0005eb6e | 01ffffff | 0005eb78 | 01ffffff | 0005eb89 | 01ffffff |
| 0240100 | 0005eb8e | 0100032a | 0005eb96 | 01ffffff | 0005ebac | 01000310 | 0005ebba | 01ffffff | 0005ebd2 | 01ffffff | 0005ebdc | 010000fc |
| 0240160 | 0005ebec | 01ffffff | 0005ebf4 | 01ffffff | 0005ebfc | 010001a0 | 0005ec12 | 01ffffff | 0005ec1c | 010002c5 | 0005ec24 | 01000382 |
| 0240240 | 0005ec2c | 01ffffff | 0005ec36 | 010003b2 | 0005ec3e | 010001f6 | 0005ec46 | 01ffffff | 0005ec52 | 01ffffff | 0005ec56 | 01ffffff |
| 0240320 | 0005ec5c | 01000340 | 0005ec72 | 01ffffff | 0005ec90 | 0100037a | 0005eca8 | 01ffffff | 0005ecbc | 0100042c | 0005ecd6 | 01ffffff |
| 0240400 | 0005ece2 | 010001f8 | 0005ecf2 | 010003d2 | 0005ed04 | 0100019e | 0005ed0a | 01000105 | 0005ed1a | 01ffffff | 0005ed3c | 01ffffff |
| 0240460 | 0005ed46 | 01ffffff | 0005ed58 | 01ffffff | 0005ed6a | 01ffffff | 0005ed74 | 01ffffff | 0005ed7c | 01ffffff | 0005ed8a | 01ffffff |
| 0240540 | 0005ed96 | 01ffffff | 0005ed9c | 010001c0 | 0005eda6 | 01ffffff | 0005edb2 | 01000369 | 0005edc0 | 010001d3 | 0005ede4 | 01ffffff |
| 0240620 | 0005ee00 | 01000391 | 0005ee22 | 01ffffff | 0005ee48 | 01ffffff | 0005ee88 | 01ffffff | 0005eebe | 01000322 | 0005eefa | 01ffffff |
| 0240700 | 0005ef38 | 01ffffff | 0005ef6a | 010001b7 | 0005ef9e | 01000448 | 0005efc2 | 01000449 | 0005efe8 | 010003e5 | 0005eff4 | 01000408 |
| 0240760 | 0005effa | 01ffffff | 0005f03e | 0100044b | 0005f068 | 01ffffff | 0005f090 | 01ffffff | 0005f0b4 | 010002c6 | 0005f0c6 | 010003c8 |
| 0241040 | 0005f0da | 01ffffff | 0005f0e2 | 01ffffff | 0005f0ec | 01ffffff | 0005f0f4 | 01ffffff | 0005f100 | 010003ad | 0005f108 | 010001a8 |
| 0241120 | 0005f114 | 01ffffff | 0005f12c | 0100029c | 0005f136 | 010002a9 | 0005f13c | 01000456 | 0005f14a | 01ffffff | 0005f152 | 01ffffff |
| 0241200 | 0005f15c | 01ffffff | 0005f170 | 01000321 | 0005f17e | 01000445 | 0005f18e | 01ffffff | 0005f196 | 01ffffff | 0005f19e | 01ffffff |
| 0241260 | 0005f1aa | 01ffffff | 0005f1b4 | 01ffffff | 0005f1bc | 01000311 | 0005f1da | 01ffffff | 0005f1e6 | 010002d9 | 0005f1fc | 01000288 |
| 0241340 | 0005f20a | 01ffffff | 0005f216 | 01ffffff | 0005f228 | 0100017c | 0005f23a | 010003a7 | 0005f250 | 010003ed | 0005f26a | 010001ca |
| 0241420 | 0005f272 | 01ffffff | 0005f280 | 01000390 | 0005f286 | 01ffffff | 0005f28e | 01ffffff | 0005f296 | 01ffffff | 0005f29e | 0100010e |
| 0241500 | 0005f2a2 | 01ffffff | 0005f2ac | 01000333 | 0005f2be | 01ffffff | 0005f2c8 | 01ffffff | 0005f2d2 | 01000439 | 0005f2da | 01ffffff |
| 0241560 | 0005f2e4 | 01ffffff | 0005f2f8 | 01000468 | 0005f30e | 01ffffff | 0005f31a | 010003c2 | 0005f324 | 01ffffff | 0005f35a | 01ffffff |
| 0241640 | 0005f366 | 010001d6 | 0005f370 | 0100047f | 0005f382 | 01ffffff | 0005f3c0 | 01000433 | 0005f402 | 010002dc | 0005f432 | 01ffffff |
| 0241720 | 0005f46a | 01000435 | 0005f474 | 01ffffff | 0005f47c | 01ffffff | 0005f498 | 01000349 | 0005f48e | 01ffffff | 0005f496 | 0100048b |
| 0242000 | 0005f4a2 | 01ffffff | 0005f4ac | 0100044e | 0005f4ce | 01ffffff | 0005f4f2 | 01000492 | 0005f51a | 01000295 | 0005f528 | 01ffffff |
| 0242060 | 0005f53e | 01ffffff | 0005f55c | 01ffffff | 0005f598 | 01000497 | 0005f5d0 | 01000498 | 0005f60c | 01ffffff | 0005f65e | 01ffffff |
| 0242140 | 0005f67a | 01000149 | 0005f686 | 01ffffff | 0005f69a | 01ffffff | 0005f6a6 | 01ffffff | 0005f6ae | 01ffffff | 0005f6d8 | 01ffffff |
| 0242220 | 0005f6e0 | 01ffffff | 0005f6f2 | 01ffffff | 0005f6fa | 0100041a | 0005f700 | 01ffffff | 0005f706 | 01ffffff | 0005f726 | 01ffffff |
| 0242300 | 0005f73e | 01000393 | 0005f760 | 01ffffff | 0005f76e | 01000337 | 0005f77e | 01ffffff | 0005f790 | 0100049c | 0005f79a | 010003f3 |
| 0242360 | 0005f7aa | 01ffffff | 0005f7b2 | 01ffffff | 0005f7ba | 01ffffff | 0005f7c2 | 01ffffff | 0005f7ce | 01ffffff | 0005f7d8 | 01ffffff |
| 0242440 | 0005f7e0 | 01ffffff | 0005f7ea | 01ffffff | 0005f7fc | 01ffffff | 0005f804 | 01ffffff | 0005f810 | 01ffffff | 0005f816 | 01ffffff |
| 0242520 | 0005f820 | 01ffffff | 0005f826 | 01ffffff | 0005f834 | 01ffffff | 0005f83e | 01ffffff | 0005f84e | 01ffffff | 0005f85c | 01ffffff |
| 0242600 | 0005f866 | 01ffffff | 0005f870 | 01ffffff | 0005f876 | 0100045c | 0005f87c | 01ffffff | 0005f886 | 01ffffff | 0005f88c | 0100014b |
| 0242660 | 0005f892 | 01000164 | 0005f8d6 | 01ffffff | 0005f8de | 01ffffff | 0005f8e8 | 01ffffff | 0005f8ee | 01000127 | 0005f8fa | 01ffffff |
| 0242740 | 0005f902 | 01ffffff | 0005f916 | 01ffffff | 0005f922 | 01000323 | 0005f930 | 01ffffff | 0005f93c | 01ffffff | 0005f94e | 01000178 |
| 0243020 | 0005f956 | 01ffffff | 0005f960 | 01ffffff | 0005f968 | 01ffffff | 0005f972 | 010001f7 | 0005f97a | 0100016d | 0005f986 | 01ffffff |
| 0243100 | 0005f990 | 01ffffff | 0005f998 | 01ffffff | 0005f9a2 | 01ffffff | 0005f9b4 | 01ffffff | 0005f9bc | 01ffffff | 0005f9c8 | 01000413 |
| 0243160 | 0005f9ce | 0100019d | 0005f9da | 01000420 | 0005f9f0 | 01000125 | 0005fa16 | 01000181 | 0005fa20 | 01000203 | 0005fa2c | 01ffffff |
| 0243240 | 0005fa34 | 01ffffff | 0005fa4a | 010001d7 | 0005fa54 | 01ffffff | 0005fa62 | 01ffffff | 0005fa70 | 01ffffff | 0005fa86 | 01ffffff |
| 0243320 | 0005fa90 | 010003db | 0005fa9a | 0100044a | 0005faa0 | 01ffffff | 0005fabc | 01000419 | 0005fad2 | 010001cc | 0005faee | 01ffffff |
| 0243400 | 0005faf6 | 01ffffff | 0005fb00 | 01000460 | 0005fb14 | 01ffffff | 0005fb20 | 01ffffff | 0005fb20 | 0100010f | 0005fb28 | 010003b6 |
| 0243460 | 0005fb34 | 01ffffff | 0005fb3e | 01000102 | 0005fb4a | 0100035b | 0005fb54 | 010004c7 | 0005fb5c | 01000411 | 0005fb70 | 0100032b |
| 0243540 | 0005fb80 | 01ffffff | 0005fb8c | 01000417 | 0005fb96 | 01ffffff | 0005fba6 | 01ffffff | 0005fbb0 | 0100046a | 0005fbce | 01ffffff |
| 0243620 | 0005fbe2 | 01ffffff | 0005fbec | 01000330 | 0005fbfe | 01ffffff | 0005fc0c | 01ffffff | 0005fc20 | 01ffffff | 0005fc2a | 01ffffff |
| 0243700 | 0005fc34 | 010004f1 | 0005fc48 | 01ffffff | 0005fc82 | 010004f9 | 0005fc8a | 010004b0 | 0005fc92 | 01ffffff | 0005fc9e | 01ffffff |
| 0243760 | 0005fcae | 010001bf | 0005fcbc | 010003ee | 0005fcca | 01ffffff | 0005fce6 | 01ffffff | 0005fcec | 01ffffff | 0005fcf6 | 010002d8 |
| 0244040 | 0005fcfe | 01ffffff | 0005fd0a | 01ffffff | 0005fd14 | 0100014d | 0005fd22 | 01000191 | 0005fd2a | 01ffffff | 0005fd36 | 010002fd |
| 0244120 | 0005fd3e | 010004e3 | 0005fd46 | 010004d4 | 0005fd54 | 01000509 | 0005fd5e | 01ffffff | 0005fd6e | 01ffffff | 0005fd7c | 01ffffff |

```
0244200 0005fd84 01ffffff 0005fd90 01ffffff 0005fd98 0100017d 0005fda8 01ffffff 0005fdb0 01000167 0005fdb8 01ffffff
0244260 0005fdc2 01ffffff 0005fdd0 01ffffff 0005fde4 01ffffff 0005fdec 01ffffff 0005fdf6 01ffffff 0005fdfc 01ffffff
0244340 0005fe08 0100028e 0005fe18 01ffffff 0005fe24 010003d5 0005fe38 010003d6 0005fe4c 010004ac 0005fe54 010003ca
0244420 0005fe5e 01ffffff 0005fe6c 01ffffff 0005fe76 01ffffff 0005fe7e 01ffffff 0005fe8c 01000430 0005fe96 01ffffff
0244500 0005fea4 0100012c 0005feb6 01ffffff 0005fee6 0100028c 0005ff10 01000399 0005ff4a 01ffffff 0005ff54 010004ab
0244560 0005ff62 01ffffff 0005ff70 01ffffff 0005ff80 01ffffff 0005ff86 01ffffff 0005ffae 01ffffff 0005ffb8 01ffffff
0244640 0005ffc6 0100043c 0005ffcc 010002b8 0005ffd8 01ffffff 0005ffe0 01ffffff 0005ffea 01000510 0005fff2 01ffffff
0244720 0005fffa 01ffffff 0006001c 010001b3 0006002e 01ffffff 00060042 01ffffff 0006004a 01ffffff 0006005e 01000204
0245000 0006008c 0100054f 000600ac 01ffffff 000600b4 01ffffff 000600bc 010003a2 000600ec 010004a6 0006010c 01ffffff
0245060 00060114 010004eb 0006011a 01ffffff 00060122 010000e0 0006012a 0100019a 0006013c 010002c7 00060148 01ffffff
0245140 00060174 0100055b 000601a6 0100048c 000601ce 0100015a 000601da 01ffffff 000601e2 01000554 00060210 01ffffff
0245220 0006021e 01ffffff 0006022a 01000518 00060234 01ffffff 0006023e 0100015e 00060246 010002c4 00060250 01ffffff
0245300 0006025a 010002da 00060264 01ffffff 00060272 010001fe 0006027e 0100047a 0006028a 01ffffff 00060296 01000434
0245360 000602c4 01ffffff 000602e4 01ffffff 00060318 01000153 0006033c 010001b6 0006035e 010004e4 00060366 01000569
0245440 00060372 01ffffff 0006037e 01ffffff 00060386 010000e2 00060394 01ffffff 0006039c 01000504 000603a6 01ffffff
0245520 000603c2 0100038d 000603cc 01ffffff 000603d6 01ffffff 000603de 01ffffff 00060422 010003ea 00060430 01000489
0245600 00060470 010004b7 00060478 01ffffff 00060486 01000195 0006049c 0100052b 000604a8 01ffffff 000604b6 010003f2
0245660 000604c6 01000499 000604d4 01ffffff 000604e4 01000314 000604f2 01ffffff 000604f6 01000172 000604fc 01ffffff
0245740 00060522 01ffffff 00060540 01000553 0006055c 01ffffff 00060584 01ffffff 0006058e 01ffffff 00060598 0100052a
0246020 0006059e 010004c4 000605aa 01ffffff 000605b2 01ffffff 000605be 01ffffff 000605cc 0100049d 000605da 01ffffff
0246100 000605e4 01ffffff 000605ec 01ffffff 000605fa 01ffffff 0006062c 01ffffff 0006065c 01ffffff 00060664 01ffffff
0246160 0006066c 01ffffff 00060696 01ffffff 000606be 01ffffff 000606d0 01ffffff 000606da 0100056f 000606fa 010004ce
0246240 00060710 01ffffff 00060716 0100034f 0006071c 01000591 00060722 0100054c 00060728 01ffffff 0006072e 01ffffff
0246320 00060734 01ffffff 00060738 0100034e 0006073c 01ffffff 00060742 01000387 00060746 010005a3 0006074c 0100056b
0246400 00060754 01000201 0006075c 01ffffff 00060762 01ffffff 00060766 0100039c 0006077c 01ffffff 000607ac 01ffffff
0246460 000607cc 01000464 000607e6 01000596 000607fc 01ffffff 00060836 01ffffff 0006086c 010005b9 000608c2 01ffffff
0246540 000608ce 01ffffff 000608f0 010003b5 000608fe 01ffffff 00060932 010005b0 00060972 01ffffff 000609d6 010003f9
0246620 00060a26 01ffffff 00060a46 01ffffff 00060aaa 01ffffff 00060af8 010004db 00060b24 01000452 00060b64 010005b3
0246700 00060bc4 01ffffff 00060bf0 01ffffff 00060c00 01ffffff 00060c18 010003a0 00060c32 01ffffff 00060c56 01ffffff
0246760 00060c88 01ffffff 00060caa 01ffffff 00060cba 01ffffff 00060cd2 01ffffff 00060ce0 0100012e 00060d1a 010005c7
0247040 00060d58 01ffffff 00060d8e 0100012b 00060da8 01ffffff 00060dc2 01ffffff 00060e04 01ffffff 00060e24 01ffffff
0247120 00060e3c 01ffffff 00060e64 01ffffff 00060ea0 01ffffff 00060ebe 01ffffff 00060ed8 0100043d 00060f00 0100044c
0247200 00060f1e 010002e6 00060f3e 01ffffff 00060f64 01ffffff 00060f90 01ffffff 00060fc2 01ffffff 00060fdc 01ffffff
0247260 00060ff8 0100057f 00061020 010001f0 0006103a 010004dd 00061058 010005e1 0006107c 010003c7 0006109e 01ffffff
0247340 000610c2 01ffffff 000610f0 0100040f 0006111a 01ffffff 00061142 0100035f 00061164 010001ad 00061196 010004de
0247420 000611ce 01000432 00061206 01ffffff 0006122e 010005f2 0006125a 010005f4 0006128c 010004f6 000612ae 010003fa
0247500 000612d4 010005f7 000612fc 010005f8 0006131c 0100036d 0006133e 010005e0 00061358 010005de 0006137c 01ffffff
0247560 000613ae 01ffffff 00061400 01ffffff 0006142c 010000ef 00061452 01000423 00061478 010002c0 0006149c 010001e2
0247640 000614c6 01000353 000614de 01ffffff 000614fe 01ffffff 0006151e 01ffffff 0006153e 01000171 00061560 010005f5
0247720 0006158a 01ffffff 000615c6 01000514 000615f2 010004b8 0006160a 010005ea 00061622 01ffffff 00061664 010004c0
0250000 00061696 0100057e 000616da 01ffffff 00000000 00000000 00000000 00000000 0009a05e 010004ba 0009a066 01000113
0250060 0009a072 01ffffff 0009a422 01000129 0009a43e 01000617 0009a4da 01000347 0009a60a 010005b1 0009a616 01000123
0250140 0009a61e 01ffffff 0009a632 01ffffff 0009a63e 01ffffff 0009a602 01ffffff 0009a73a 01ffffff 0009a7a2 0100011e
0250220 0009a7ae 01ffffff 0009a966 010004d7 0009a97e 01ffffff 0009aa06 01000418 0009aa36 01000564 0009cac2 01ffffff
0250300 0009cb6a 01ffffff 0009cbfa 01000628 0009cc2e 01ffffff 0009ecb2 01ffffff 0009ed7e 01ffffff 0009edb6 010004ec
0250360 000a0e4e 01ffffff 000a0ece 01ffffff 000a150a 01000473 000a151a 01ffffff 000a152a 01000601 000a153a 01ffffff
0250440 000a1546 01ffffff 000a180e 01ffffff 000a16ca 01ffffff 000a1d4a 01000635 000a264a 010004d6 000a0f32 01ffffff
0250520 0009ee4a 01ffffff 0009ee7e 01ffffff 0009ed76 01000361 000a18be 0100046d 000a18b6 01ffffff 000a465e 01000351
0250600 000a4666 01000624 000a263e 010003aa 000a0eae 01ffffff 000a2352 01ffffff 000a20fa 010001a1 000a2632 01ffffff
0250660 000a1ede 01ffffff 000a47ba 01ffffff 000a26ae 010001b1 000a26e2 01ffffff 000a261a 01ffffff 000a1dfa 01ffffff
0250740 000a2602 010001a3 000a47aa 01ffffff 000a481a 01ffffff 000a484e 01000183 000a67ea 01000479 000a260e 01000345
0251020 000a6866 010004af 000a695e 01ffffff 000a6992 01ffffff 000aaa4a 010001fd 000a89ae 01ffffff 000a89e6 01ffffff
0251100 000a2366 0100057c 000aab0a 01000550 000aab3e 0100017e 000aeb1a 010003b3 000a0e46 0100034a 000acb6a 01ffffff
0251160 000acb9e 0100036e 000b0c26 01ffffff 000b0b72 01ffffff 000b0c36 01ffffff 0009cc92 01ffffff 0009ccc2 01ffffff
0251240 0009cd1e 01ffffff 000b2c4a 01ffffff 000a47a2 01ffffff 000b2c56 01000658 000b2c62 01ffffff 0009cdb6 01ffffff
```

```
0251320  0009cdea 0100064a 000b4caa 01ffffff 000b4cb2 01ffffff 000aaa8a 01000168 000b4d12 0100065c 000b4d2a 01000292
0251400  000b4d42 01ffffff 000b4d56 0100066a 000b2c6e 01ffffff 000b2c76 01ffffff 000b4d8e 01ffffff 000b4d96 01ffffff
0251460  000b4dda 01ffffff 000b4df6 01ffffff 000b4e42 01ffffff 000b4e82 01000117 000b4ea2 01ffffff 000b4d7e 0100058d
0251540  000b4e3a 01ffffff 000b4ee6 0100051e 000b4dd2 010004c1 000b4f22 01ffffff 000b4f4e 01000638 000b4d32 01ffffff
0251620  000b4f96 01000197 000b4fba 01ffffff 000b4fda 01000372 000b4ff6 01ffffff 000b5012 01ffffff 000b502e 010003e3
0251700  000b5086 01000636 000b50a2 01ffffff 000b50c2 01ffffff 000b5106 01ffffff 000b515e 01ffffff 000b51b6 01ffffff
0251760  000b5062 01ffffff 000b506a 01ffffff 000b50f6 010002d7 000b50fe 01ffffff 000b5142 01000407 000b528e 01ffffff
0252040  000b52ae 01ffffff 000b52ca 01ffffff 000b52fa 01ffffff 000b5326 01ffffff 000b5346 01ffffff 000b5366 01ffffff
0252120  000b5382 01ffffff 000b53a2 01ffffff 000b53c2 010005a5 000b53f2 01ffffff 000b5422 010002cc 000b5442 010004d5
0252200  000b546a 01ffffff 000b548a 01ffffff 000b54aa 01000546 000b54c6 01ffffff 000b54f2 0100033e 000b5512 01ffffff
0252260  000b552e 01000555 000b4f1a 01ffffff 000b4d86 01ffffff 000b5572 010002b0 000b541a 01ffffff 000b53e2 01ffffff
0252340  000b53ea 010004d9 000b5316 01000524 000b4cde 01000671 000b2cd6 01000132 000b2d06 0100047d 000b55e2 01000472
0252420  000b4da2 0100062b 000b5602 010005ce 000b531e 01ffffff 000b76c6 01ffffff 000b773e 01ffffff 000b7792 01000112
0252500  000b4e72 01000598 0009cea6 01ffffff 000b7846 010000f4 000b78a6 010005ad 000b793a 01ffffff 000b7976 01000373
0252560  000b79ea 01ffffff 000b5262 010004e2 000b513a 01ffffff 000b7a46 0100062c 000b7a52 0100053c 000b7af2 01000503
0252640  000b7b3e 010004b5 000b7b8e 01ffffff 000b7b9a 01ffffff 000b7d06 01ffffff 000b7d86 01ffffff 000b7da6 010006a8
0252720  000b7db2 01ffffff 000b7e46 01000182 000b7ea6 0100037c 000b7e66 010006ae 000b7ffe 010006b7 000b3156 01ffffff
0253000  000b811a 01000147 000b812a 01ffffff 000b814a 01ffffff 000b7e6e 010005f9 000b4e7a 01000384 000b527e 01000440
0253060  000b7dde 0100069e 000b819e 01ffffff 000b81aa 01000455 000b813a 01000532 000b81e2 01ffffff 000b8222 010004cb
0253140  000b7d46 01ffffff 000b7b0e 01000396 000b821a 010003a6 000b8212 010001ea 000b81da 01000517 000b82ca 01ffffff
0253220  000b82ee 0100032e 000b832a 0100061a 000b835a 010004c5 000b836e 01ffffff 000b8382 01000150 000b8396 01ffffff
0253300  000b83d2 010005cd 000b840e 01ffffff 000b844e 010005c1 000b848a 01ffffff 000b84ca 01ffffff 000b8506 01000544
0253360  000b863e 010003a3 000b877a 01ffffff 000b8786 01ffffff 000b884a 01000422 000b897a 01ffffff 000b8982 01000189
0253440  000b898e 01ffffff 000b86ea 01ffffff 000b8a86 0100012f 000b8ae2 010004f3 000b8aee 01ffffff 000b8b4e 01ffffff
0253520  000b8b62 0100053a 000b8bc2 0100019d 000b8bd6 01ffffff 000b8c52 01ffffff 000b8c62 01000583 000b8cbe 01ffffff
0253600  000b8cce 01ffffff 000b8d8e 010006a7 000b8d9e 01000675 000b8f96 010006b9 000b8fea 01ffffff 000b904e 01000380
0253660  000b90da 01000540 000b9202 01000600 000b92a2 01000707 0009d8ca 0100067d 000b568e 01ffffff 000b56c2 010003bf
0253740  000b92ea 01ffffff 000b888a 01ffffff 0009d1de 01ffffff 0009d2b2 01000185 0009d282 01ffffff 0009d2ee 01ffffff
0254020  000b7c16 01000568 000b4c9e 01ffffff 000b4c7a 01ffffff 000bd596 010006fe 000b8daa 0100030d 000b8c6e 01ffffff
0254100  000bd5a2 01000461 000bd5ae 010003f7 000bd5ba 01ffffff 000b8afe 0100070d 000b8a92 01000700 000bd5c6 01ffffff
0254160  000bd5d2 010005c0 000bd5de 01000263 000bd5ea 010006d2 000bd5f6 010004d0 000bd602 01ffffff 000bd60e 0100046e
0254240  000bd61a 01000490 000bd626 010001e3 000bd962 01ffffff 000bda22 01ffffff 000be0e6 01ffffff 000bffa6 01000170
0254320  000bb612 01ffffff 000bb64a 010006ad 000bff8e 010004a8 000bff82 01ffffff 000bff76 01ffffff 000bff6a 01000487
0254400  000bff5e 010005d7 000bdf12 01ffffff 000c209a 0100050f 000bfec2 0100018b 000bfece 010004aa 000bfeda 01000659
0254460  000bddc6 0100070b 000b95de 01ffffff 000b960e 01000708 000c4402 01ffffff 0009d19e 01ffffff 000b97ea 0100073a
0254540  000bde12 01ffffff 000c4432 0100073b 000c4456 010005d8 000c446a 010006b6 000bfefe 01ffffff 000bff2e 01ffffff
0254620  000bfee6 010006ed 000bda2a 01ffffff 000b0c6e 01ffffff 000b0c9e 010006dc 0009cd76 01000680 000c6506 010004cf
0254700  000c6566 010002d4 000aabfa 01ffffff 000c44c2 0100061f 000bfef2 01000501 000c669e 010006e7 000c66fa 0100062f
0254760  000bdd42 01ffffff 000b90ea 01000745 000b931a 01ffffff 000c44de 01ffffff 000c450a 01000608 000bd9a2 01ffffff
0255040  000c87c2 010004d1 000c8802 01ffffff 000c8852 01ffffff 000c886e 01000756 000be052 01ffffff 000c88c6 01000397
0255120  000bff0a 01ffffff 000c88de 010006ce 000c88f6 01ffffff 000c896e 01ffffff 000b0d2a 01000694 000c89be 01000173
0255200  000c89d2 01ffffff 000c8a42 01000531 000c8ab2 0100068e 000be102 010006ef 000c8ac2 010002ff 000bff16 01ffffff
0255260  000c8b02 01ffffff 000a6856 01ffffff 000c8b2e 01000764 000c8b8a 010006e0 000be012 01000438 000c8bd6 01ffffff
0255340  000c8c1e 01000769 000c8c8a 0100053f 000c8c9e 01ffffff 000c8cae 01000677 000c8cc2 01ffffff 000c8cd2 010005bb
0255420  000c8ce6 01ffffff 000c8cfa 01000760 000c8d5a 01ffffff 000c8d6e 0100076f 000c8d86 01000593 000c8d9a 01ffffff
0255500  000c8db2 01ffffff 000c8dc6 01000772 000c8dde 01000502 000c8f06 01ffffff 000c8f16 01000687 000bfe92 01ffffff
0255560  000c903e 0100077b 000c4bba 0100077c 000bfe86 01ffffff 000bfe7a 01ffffff 000c925a 01000691 000c9282 01000780
0255640  000bfe6e 01ffffff 000c9392 010002b7 000c94ea 01ffffff 000bfe62 01000336 000bf9d6 01ffffff 000c96a6 0100055a
0255720  000c96c2 0100067e 000c96d2 0100032d 000c976e 01ffffff 000c9786 0100013d 000c981a 010005af 000c9842 01ffffff
0256000  000c98e6 0100078c 000c98fe 010002b6 000c9906 01000527 000c9912 010005c5 000c994a 01000400 000c9956 0100031a
0256060  000c9986 01000484 000c998e 0100078f 000c99e2 010002b7 000c9a16 01ffffff 000c9a36 01000500 000c9a52 010005ef
0256140  000c90e6 01ffffff 000c9ab2 01ffffff 000c9b3a 01000761 000c9b86 01ffffff 000c9be6 01ffffff 000c9bfe 010007a0
0256220  000c9c76 01ffffff 000c9c8a 01ffffff 000c9c9a 01000521 000c9cae 01ffffff 000c9cc6 01ffffff 000c9cd6 01ffffff
0256300  000c9d5e 010003cc 000c9d6a 01ffffff 000c9dc6 01000298 000c9716 010007a9 000c9dd6 010004cc 000c9dee 01000639
0256360  000c9e02 01ffffff 000c9e12 01ffffff 000c9e1e 01ffffff 000c9e36 010007a4 000c9e4e 010002d0 000c9e6a 01ffffff
```

```
0256440  000c9e7a 01ffffff 000c9e8a 010007b2 000c9e9e 01ffffff 000c9eae 01ffffff 000c9ebe 01000699 000c9ece 01ffffff
0256520  000c9ee2 010007b5 000c9ff6 010001cd 000ca002 01ffffff 000c932e 01ffffff 000ca012 01ffffff 000c9316 01ffffff
0256600  000ca022 01ffffff 000ca036 01000563 000ca04e 01ffffff 000ca066 01000467 000ca076 01ffffff 000ca08a 01ffffff
0256660  000ca09e 010005b4 000ca112 010004ed 000c916e 01ffffff 000ca126 01000385 000ca13a 010002fb 000ca13c 01ffffff
0256740  000ca19e 01000586 000ca1b2 0100041e 000ca1c2 010007c7 000ca56a 01ffffff 000c67a6 010004b9 000c67d6 01ffffff
0257020  000ca0c6 01ffffff 000c8e3e 0100058a 000ca336 010000f6 000ca1fa 01ffffff 000ca152 01000771 000ca356 01ffffff
0257100  000cc662 01000673 000cc676 01ffffff 000ca53a 0100045e 000c9b76 010007da 000c9a82 01ffffff 000c99c2 01ffffff
0257160  000c993a 0100076e 000cc7be 010005da 000ca4aa 01ffffff 000ca486 01ffffff 000ca46e 01ffffff 000c96fe 010005df
0257240  000cc87a 010007d3 000c959a 01000779 000ca426 01ffffff 000cc91a 010007d8 000cc932 010007d9 000c931e 01ffffff
0257320  000c90d6 01ffffff 000b8ed6 010003b7 000ca576 010005c6 000ca5a2 010005bd 000ccaca 010003a8 000c685e 010004e1
0257400  000cca52 01ffffff 000ccabe 010003c6 000c92b2 010005b8 000cca72 010007e7 000ceb86 010007e8 000cec06 0100079c
0257460  000cec1a 01ffffff 000c8f46 0100043e 000cecd2 010007d4 000ced2e 01000566 000ced86 010007a5 000cef9e 01000506
0257540  000cf006 01ffffff 000cf01a 01000001 000a47b2 01000747 000cf02e 01ffffff 000c8a7a 010006fb 000cf03a 01ffffff
0257620  000cf046 01ffffff 000cf05e 01ffffff 000c8832 01ffffff 000cf1e6 010007e4 000cf1fa 01000163 000c87b2 01000267
0257700  000c8782 01000797 000cf31e 01000807 000cf32e 01ffffff 000cf33e 01000559 000cf3a6 010003bc 000c911e 010006b5
0257760  000cf4ae 010007fd 000cf56a 010007f3 000cf57e 010007f4 000cf602 01ffffff 000cf7ae 01ffffff 000cf806 01ffffff
0260040  000cf81a 01ffffff 000cf8be 010007d2 000cf946 01000495 000c876a 0100074b 000cfa66 01ffffff 000cfac6 01ffffff
0260120  000cfad6 01ffffff 000cfae2 01ffffff 000cfaee 01ffffff 000cfafa 01ffffff 000cfc0a 0100064e 000cfd2a 01ffffff
0260200  000cfe32 01000451 000cfe46 01000805 000cfe5a 01000806 000cfe6e 010003e0 000cff9a 01000308 000cffaa 010006c3
0260260  000cffb6 01ffffff 000d004a 01000758 000d00f2 0100080f 000d0106 01000810 000c1302 01000802 000d0472 01000128
0260340  000d04aa 010003c5 000d051e 01000193 000d053e 010004c2 000d054e 0100080a 000d07de 0100073e 000d0572 01000208
0260420  000ccb02 01000535 000ccb32 01000754 000d043a 01000672 000d039e 01ffffff 000d02ee 01000749 000d07d2 01ffffff
0260500  000d07ba 01ffffff 000d07ae 010005e9 000cfd3e 01000512 000ca62a 0100059d 000d071e 010007dc 000d0706 01000661
0260560  000cf83e 01000589 000cf61e 01000833 000d0816 0100083e 000d084a 01000162 000cf962 01000660 000ccbbe 01000616
0260640  000d0646 010006eb 000d0052 01ffffff 000d05fe 01000828 000d4bd2 01000829 000d4d82 01ffffff 000cf8ee 01ffffff
0260720  000cfa16 01000623 000d4fea 01ffffff 000d258e 010001c2 000c9bbe 01ffffff 000d5086 01ffffff 000d08d6 01000841
0261000  000d2afa 01000122 000d2b26 010003a5 000d52b2 01ffffff 000d529a 010005bf 000d5282 0100048d 000d525e 01ffffff
0261060  000d76ba 01ffffff 000d77be 0100065f 000d76f6 0100075a 000d52ea 0100082a 000d531a 01000851 000d77ca 01ffffff
0261140  000cffd2 01ffffff 0009e3d2 01ffffff 000d799a 01ffffff 000d5206 01ffffff 000bdb7a 01000854 000d7c16 010005eb
0261220  000d7c9a 0100055d 000d061e 01ffffff 000d7d82 01ffffff 0009ec56 01ffffff 000d7e16 01000724 000d8016 0100037f
0261300  000d7ef6 0100085a 000c970e 010006f2 000aeb6a 01000722 000aeb96 01ffffff 000d810e 01000665 0009dcaa 01000557
0261360  000d8066 010001ae 000c87f2 01ffffff 000d8086 010007b3 000d80ae 01ffffff 000c9c36 010007f6 000da22a 01000872
0261440  000d01da 010003e9 000da2e2 0100049b 000da2f6 010005d0 000da306 01ffffff 000d7756 010002c3 000da3c6 01000812
0261520  000da472 01ffffff 000da47e 01ffffff 000da196 01000135 000a44a6 01000858 000da4e2 01ffffff 000da4ee 01000834
0261600  000a5176 0100087d 000da586 01000651 000da59a 01ffffff 000da852 0100053d 000da8ce 010006d4 000da956 01000878
0261660  000daa76 01ffffff 000dac86 010006d6 000a7c36 01ffffff 000dad06 01ffffff 000dad1a 010002c8 000dad2a 01000889
0261740  000daf02 01ffffff 000daf0e 01ffffff 000db426 010007d1 000db236 01000626 000d8146 0100065b 000d8176 010002e3
0262020  000dd43a 01ffffff 000db40e 01ffffff 000dd49e 01ffffff 000dd51a 0100055e 000dafbe 010007ac 000dadf2 01000891
0262100  000db432 01ffffff 000db45e 01ffffff 000daf2a 01ffffff 000a88fe 01ffffff 000db372 01ffffff 000db37e 01000765
0262160  000d8202 01000860 000db396 01ffffff 000df65e 01000666 000aec1e 010004a4 000dab32 0100031f 000df726 01ffffff
0262240  0009dec6 01ffffff 000daa16 01ffffff 000db2ba 010007b1 000da8ee 010008a1 000df7c6 010008a5 000df822 01ffffff
0262320  000df882 010008a9 000db2ee 01ffffff 000db2e2 01ffffff 000df986 01000789 000dfa42 01000668 000dfaa2 01000768
0262400  000dfb6a 010008ad 000dfb7e 010007b6 000dfbf6 01000363 000dfd4a 0100089f 000dfd5e 010001e5 000dfd7a 010008b1
0262460  000dfee6 01ffffff 000dff4a 01ffffff 000dacb6 01000426 000dffe6 010000e8 000e00aa 01ffffff 000e0146 010008b5
0262540  000e01d6 010000e5 000e01e2 010005a0 000e01ee 010007f9 000e0632 01000120 000e042e 01ffffff 000dd61e 010008c0
0262620  000dd652 01ffffff 000e0626 010001c7 000e00c6 01ffffff 000db4e6 01ffffff 000e0006 01000161 000df f66 01000582
0262700  000e049a 010007fc 000dd6e2 010008c2 000e066a 01000837 000e069a 01000726 000e04ba 010002cd 000e2816 01ffffff
0262760  000e004a 010008cb 000dfd9e 01ffffff 000e285e 0100079a 000e288e 0100039f 000dfb0a 01000360 000d7e2e 01ffffff
0263040  000e6906 01ffffff 000e0726 010006ea 000d7b02 0100031e 000e48aa 010008c8 000e69f2 01ffffff 000dab9e 010008d1
0263120  000e6c9a 01ffffff 000e4906 01ffffff 000e4936 01ffffff 000e6c8e 01000289 000d7d9e 0100054e 000e291a 01000816
0263200  000e48be 010008df 000e6c5a 01000444 000e8eea 010008e1 000e8f1a 01ffffff 000e8f4a 0100031c 000daf3a 010001a7
0263260  000e8ffe 010008dc 000e49c2 010007d7 000e6cd2 010008e7 000e6d06 0100015f 000e9102 01ffffff 000eb13a 01000576
0263340  000eb15e 010005f1 000e8f0a 01000663 000eb1f2 01ffffff 000eb20e 0100089a 000e90de 010008e2 000e8e6a 01ffffff
0263420  000e8e22 0100033b 000b96c6 010008e9 000eb37e 01ffffff 000e9146 010008f4 000e917a 01ffffff 000e91de 01ffffff
0263500  000e908a 01000618 000e9096 01ffffff 000ed4da 010003ce 000da742 01000886 000e8e9a 010006b1 000e90ba 010006e3
```

```
0263560  000e910e 01ffffff 000e8d02 0100079e 000ed6f6 010007d6 000dad6e 01ffffff 000da7f2 0100073f 000ed7ce 010005d9
0263640  000ed852 01000787 000ed8b6 01000803 000ed8ce 010007c4 000ed96e 01000869 000ed97e 0100089c 000eda1e 010008ca
0263720  000eda2e 0100071d 000eda3e 01ffffff 000eda76 010008f6 000b761e 010000e1 000eb3ae 01ffffff 000eb3da 01000709
0264000  000ed992 01ffffff 000ed906 010006d3 000edae6 01ffffff 000edada 01000537 000edaf2 01ffffff 000edb1e 0100083f
0264060  000ed79a 01ffffff 000edbba 01ffffff 000edace 01ffffff 000edcfa 01ffffff 000edd8a 0100084b 000ede12 0100091a
0264140  000ede9a 010003dc 000edf26 01000880 000edfa6 0100091d 000ee022 010002bf 000f1b8a 0100071a 000f1bb2 010006c9
0264220  000f1bda 010006b4 000f1c02 010008cd 000f1c2a 01000332 000f1c52 01000184 000f1c7a 0100039e 000f1c9e 01ffffff
0264300  000f1cc6 01ffffff 000f1cee 0100070a 000f1d16 01ffffff 000f1d3e 01ffffff 000f1d66 01ffffff 000f1d8e 01000629
0264360  000f1db6 01ffffff 000ee682 0100091b 000ee706 0100092f 000ee782 01000859 000ee80e 01000931 000ee896 0100091f
0264440  000ee342 01000738 000ee9fa 0100091e 000eea76 01000932 000eeaf2 01000936 000eeb6e 01000937 000f1b6a 01000935
0264520  000f1dde 01ffffff 000f1dfe 01ffffff 000e8eda 01ffffff 000f1e7e 01000577 000f1eb6 010008d2 000f1f5e 0100093d
0264600  000e907e 01ffffff 000e8f8e 0100026c 000f1f82 01ffffff 000f1ed6 010003be 000f1faa 01000943 000f1fe6 01000944
0264660  000e9072 01000716 000f1ea6 0100082c 000f048a 01000947 000e905a 01000725 000f402e 01ffffff 000f4032 01000462
0264740  000f4036 01ffffff 000f403a 01000918 000f403e 01ffffff 000f4042 01ffffff 000f4046 010002bb 000f404a 01ffffff
0265020  000f404e 010006cc 000f4052 010006a1 000f4056 010006d7 000f405a 01ffffff 000f405e 010008bf 000f4062 0100056d
0265100  000f4066 010006ec 000f406a 01ffffff 000f406e 01ffffff 000f4072 010002d2 000f4076 01000493 000f407a 01000813
0265160  000f407e 01000702 000f4082 01ffffff 000f4086 01ffffff 000f408a 01ffffff 000f408e 0100075c 000f4092 01ffffff
0265240  000f4096 01000404 000f409a 01ffffff 000f409e 010000f3 000f40a2 01ffffff 000f40a6 0100011b 000f40aa 010003ac
0265320  000f40ae 01ffffff 000f40b2 010006fd 000f40b6 01ffffff 000f40ba 01ffffff 000f40be 01ffffff 000f40c2 01000318
0265400  000f40c6 010003e8 000f40ca 01ffffff 000f40ce 01000148 000f40d2 01ffffff 000f40d6 010003df 000e904e 0100065a
0265460  000e0e7a 010001ec 000ee376 010006bc 000f40da 0100039a 000dac36 010003fc 000f416e 0100061c 000f47f6 01000285
0265540  000f1de6 0100048f 0009aa4e 01ffffff 0009aa7a 01ffffff 00000000 00000000 00000000 00000000 00000000 00000000
0265620  00000000 00000000 00000000 00000000 00000000 00000000 00000000 00000000 00000000 00000000 00000000 00000000
*
0417540  00000000 00000000 00000000 00000000 00000000 00000000 00000000 00000000 000000db 00000431 ffffffff 000008bb
0417620  0000016a 00000717 000003ab ffffffff ffffffff ffffffff 00000642 ffffffff 000006f3 000004f0 000006e8 ffffffff
0417700  ffffffff 00000597 ffffffff ffffffff ffffffff ffffffff 00000307 ffffffff ffffffff ffffffff ffffffff 00000882
0417760  00000324 00000643 ffffffff ffffffff 000007ca 00000107 00000159 000005fb 00000111 000005d2 0000094a 000006f6
0420040  00000131 0000013f 00000140 00000146 000006d0 000003e6 0000080e 00000157 ffffffff ffffffff ffffffff ffffffff
0420120  00000634 000006ba 0000052d ffffffff 00000578 ffffffff 0000030e 00000644 00000339 000007ba 000001aa 000005f0
0420200  0000094b 0000094c 00000941 00000359 0000094e 0000094f 00000950 00000951 00000952 00000953 00000954 00000955
0420260  00000956 00000957 00000958 00000959 0000095a 000002d5 0000095b 0000095c 0000095d 0000095e 0000095f 00000960
0420340  00000961 00000962 00000963 000002a7 000008b0 00000334 000008cc 000006c6 00000964 00000354 00000785 0000038b
0420420  00000736 00000786 000003e1 00000965 00000966 00000428 00000967 00000968 00000969 00000477 0000096a 0000096b
0420500  0000096c 0000096d 000004f2 0000096e 0000096f 00000970 00000840 00000971 00000972 00000973 000005aa 000005ab
0420560  000006bb 000005b2 00000974 000007bd ffffffff 0000058c ffffffff 00000507 00000836 ffffffff 00000669 00000198
0420640  0000054b 00000508 ffffffff 0000029b 000008c6 00000895 000006b3 000003b0 000007a2 000002ad 00000145 ffffffff
0420720  00000166 000005dc ffffffff 0000063e 0000014c 0000078d ffffffff 0000037b 000008c9 ffffffff ffffffff ffffffff
0421000  00000681 0000019c ffffffff ffffffff 000003ae 0000063d 000005ca ffffffff ffffffff ffffffff 0000073d 0000086e
0421060  000003c4 000001e6 00000516 ffffffff 000007a6 000004df ffffffff ffffffff 0000064c 00000770 000008e5 00000459
0421140  000004f5 000001ab 000001ac 000007c8 00000358 ffffffff 00000648 00000152 000008d4 00000486 ffffffff ffffffff
0421220  000006a4 0000037e 0000013c ffffffff 00000602 0000014f ffffffff 00000154 00000929 000003e7 ffffffff 00000774
0421300  ffffffff ffffffff ffffffff 0000029a 0000064f ffffffff ffffffff ffffffff 0000081c 00000862 000005e5 000001fc
0421360  0000092a 0000075b 00000637 0000074e 00000927 000003cb 000007c6 0000088a 00000416 00000441 000005c8 000002c9
0421440  00000928 ffffffff 000002ef 00000374 000001be 0000042e 0000084d ffffffff 0000092c ffffffff 00000792 ffffffff
0421520  0000088f 000003dd 00000855 0000063a ffffffff ffffffff 0000077e 000007bf 0000088e ffffffff 00000313 ffffffff
0421600  00000202 0000079f ffffffff 0000035a 00000746 ffffffff ffffffff 000003d1 0000089d ffffffff ffffffff ffffffff
0421660  000007f0 00000775 ffffffff ffffffff ffffffff ffffffff 000006f4 00000000 0000093a 0000093e 00000839 ffffffff
0421740  000005ae ffffffff 000000ff 00000814 ffffffff ffffffff 00000101 00000130 000003f1 00000603 000007c2 ffffffff
0422020  00000923 ffffffff ffffffff 0000088c 00000924 00000640 0000053b ffffffff 00000925 ffffffff 000008fa ffffffff
0422100  ffffffff 0000040d ffffffff 00000984 0000030c ffffffff 000006c8 ffffffff 00000429 0000080c ffffffff 000006e5
0422160  ffffffff 000006d5 000005be ffffffff 00000609 ffffffff 000006e6 000002d6 00000692 0000044d ffffffff 000006ee
0422240  000008a7 00000592 0000081d 000004a5 000006e4 0000097e 000004c9 00000614 0000066f ffffffff ffffffff 000005e7
0422320  ffffffff ffffffff 000005a4 000006a3 000005a8 0000061b ffffffff 00000457 0000018e ffffffff 000008ab 00000827
0422400  ffffffff 00000526 ffffffff ffffffff ffffffff 000005fd 000005dd 0000054a 00000783 ffffffff ffffffff 00000703
```

| | | | | | | | | | | | | |
|---|---|---|---|---|---|---|---|---|---|---|---|---|
| 0422460 | 00000654 | ffffffff | ffffffff | ffffffff | 000007fa | 000006bd | 0000029f | 000005ac | 00000367 | 00000571 | 000007a1 | 0000063c |
| 0422540 | ffffffff | 0000081b | ffffffff | ffffffff | 0000093b | 0000035c | 000008e4 | 00000599 | 00000861 | 00000825 | 000007ce | ffffffff |
| 0422620 | 0000062d | 00000560 | ffffffff | ffffffff | 000005ee | ffffffff | 000006c4 | ffffffff | 000006f0 | 000008d6 | ffffffff | 00000711 |
| 0422700 | 00000447 | ffffffff | 000007cb | ffffffff | 0000090f | ffffffff | 00000567 | ffffffff | 00000595 | ffffffff | 00000594 | 00000106 |
| 0422760 | ffffffff | 0000080b | ffffffff | 00000710 | 0000090b | ffffffff | 00000366 | ffffffff | 00000897 | 000001a6 | 000005c4 | ffffffff |
| 0423040 | ffffffff | ffffffff | 00000933 | ffffffff | ffffffff | 000005e3 | 00000904 | ffffffff | ffffffff | 00000615 | 000008eb | ffffffff |
| 0423120 | 00000867 | 000007a7 | 000003a9 | 00000388 | ffffffff | 000001b2 | ffffffff | 00000450 | 0000063b | ffffffff | 0000081a | 0000032c |
| 0423200 | 00000350 | 00000375 | 00000355 | ffffffff | 00000819 | 0000059e | ffffffff | ffffffff | 000004ca | ffffffff | ffffffff | ffffffff |
| 0423260 | 0000090c | ffffffff | 0000041c | ffffffff | ffffffff | 0000030f | 000002b3 | 0000040a | 0000065e | 00000319 | ffffffff | ffffffff |
| 0423340 | ffffffff | ffffffff | 000000e4 | ffffffff | ffffffff | 0000042d | ffffffff | ffffffff | 00000713 | 00000478 | ffffffff | ffffffff |
| 0423420 | 0000062a | ffffffff | ffffffff | ffffffff | ffffffff | 000001a9 | ffffffff | 00000445 | 00000718 | ffffffff | ffffffff | 0000014e |
| 0423500 | ffffffff | ffffffff | 0000090e | ffffffff | 00000830 | ffffffff | 000000fd | ffffffff | ffffffff | ffffffff | ffffffff | ffffffff |
| 0423560 | 0000092d | ffffffff | 000005ba | ffffffff | 00000317 | 00000610 | 000007e6 | ffffffff | 00000732 | ffffffff | ffffffff | ffffffff |
| 0423640 | 00000979 | 000002a1 | ffffffff | 000000f5 | 00000715 | 000002c2 | 0000040b | ffffffff | ffffffff | ffffffff | ffffffff | ffffffff |
| 0423720 | ffffffff | 000003b1 | 000007e0 | 00000750 | 000001bd | 0000010c | 00000664 | 0000010d | 00000437 | 0000048a | 0000060f | ffffffff |
| 0424000 | 00000784 | 0000046c | 0000078e | ffffffff | 000008ce | 0000077f | ffffffff | 000002ca | 0000090a | ffffffff | 00000402 | ffffffff |
| 0424060 | 0000045b | ffffffff | 00000735 | 000003c1 | ffffffff | 00000124 | ffffffff | ffffffff | 000000ee | 0000057d | 00000853 | 00000683 |
| 0424140 | 00000480 | 0000088b | 000004cd | ffffffff | 00000522 | ffffffff | ffffffff | ffffffff | 000008f1 | 00000315 | 000007ae | 000006ca |
| 0424220 | 0000082d | ffffffff | 000005c3 | 0000071c | 000008b3 | ffffffff | ffffffff | 000004be | 0000084c | 000006d9 | 00000838 | 0000076d |
| 0424300 | ffffffff | 00000913 | ffffffff | 00000436 | 000006b0 | 0000071b | 00000817 | 00000728 | 00000916 | ffffffff | ffffffff | ffffffff |
| 0424360 | 00000410 | 00000611 | ffffffff | ffffffff | ffffffff | ffffffff | 0000051b | 000008ae | ffffffff | 0000070c | 000003eb | ffffffff |
| 0424440 | ffffffff | ffffffff | 000003ba | ffffffff | 0000097a | 000005a2 | 000000de | 000007ab | 00000920 | 00000481 | ffffffff | ffffffff |
| 0424520 | 00000186 | 000008d0 | 000000f2 | ffffffff | ffffffff | ffffffff | 000004c3 | ffffffff | 00000646 | ffffffff | 0000061d | 0000086a |
| 0424600 | ffffffff | 000007cc | ffffffff | ffffffff | 000008fd | 0000039b | 000005d3 | 000004da | ffffffff | ffffffff | ffffffff | ffffffff |
| 0424660 | 000008c7 | ffffffff | 000005e2 | ffffffff | 00000207 | 00000831 | 00000211 | 000003b4 | 0000026b | 00000941 | 00000275 | 00000344 |
| 0424740 | 0000027f | 00000280 | 000008dd | 00000282 | 00000283 | 00000284 | 0000097b | 00000286 | 00000287 | 0000046b | 00000261 | 000004ad |
| 0425020 | 0000071f | 00000264 | 00000265 | 00000266 | 00000809 | 00000268 | 00000269 | 0000026a | 0000069a | 00000151 | 00000798 | ffffffff |
| 0425100 | ffffffff | 00000734 | 000008b6 | 00000392 | ffffffff | 000007e1 | ffffffff | ffffffff | 000003fd | 00000656 | 00000720 | 0000066b |
| 0425160 | 000007cf | 0000042b | ffffffff | 0000083a | 00000689 | 00000866 | 000007c0 | ffffffff | 0000066d | 00000118 | ffffffff | 000001d9 |
| 0425240 | 0000079b | ffffffff | ffffffff | ffffffff | 00000899 | ffffffff | 00000976 | 0000036b | 000003cf | ffffffff | 000007c9 | ffffffff |
| 0425320 | 00000686 | ffffffff | 00000647 | 000007b7 | 00000922 | 000008b2 | 000004fd | 00000627 | ffffffff | 000003da | 00000887 | 0000084a |
| 0425400 | 000003f8 | 00000721 | 00000906 | 000008ba | ffffffff | 0000078a | 0000068f | ffffffff | 00000921 | ffffffff | 00000945 | ffffffff |
| 0425460 | 00000723 | 00000342 | 0000082e | ffffffff | ffffffff | 00000386 | 000008a0 | 00000911 | 00000742 | 00000630 | 0000089e | ffffffff |
| 0425540 | ffffffff | 00000690 | 0000087a | 00000511 | ffffffff | ffffffff | 00000763 | 00000846 | ffffffff | 00000679 | 00000562 | ffffffff |
| 0425620 | 00000909 | ffffffff | ffffffff | ffffffff | 0000087f | 000005e8 | 0000060c | ffffffff | 00000821 | 0000043a | 000006a0 | 000007ad |
| 0425700 | 00000515 | ffffffff | ffffffff | ffffffff | ffffffff | 0000063f | 000007dd | 000008e3 | 00000409 | 000006c7 | 0000075e | ffffffff |
| 0425760 | 00000934 | 000002dd | 00000556 | 000006a8 | ffffffff | 000005a7 | 000004b4 | 00000737 | 0000069c | 000005a6 | 000007f5 | ffffffff |
| 0426040 | 000005a9 | 00000421 | 000008bc | 00000706 | 000004b2 | 000001c4 | ffffffff | 000008ac | 00000674 | 00000808 | ffffffff | ffffffff |
| 0426120 | ffffffff | 000007fb | ffffffff | ffffffff | ffffffff | 000008ec | ffffffff | ffffffff | 000004bc | 000003e4 | 0000042f | ffffffff |
| 0426200 | ffffffff | ffffffff | ffffffff | 00000362 | ffffffff | 000004ea | 000007f7 | ffffffff | 000008a3 | ffffffff | ffffffff | 00000693 |
| 0426260 | 0000011f | ffffffff | ffffffff | ffffffff | ffffffff | ffffffff | ffffffff | ffffffff | 00000192 | 0000051c | 0000069d | 00000751 |
| 0426340 | 0000012d | ffffffff | ffffffff | ffffffff | ffffffff | ffffffff | 00000414 | 000007a3 | 0000040c | ffffffff | 00000496 | ffffffff |
| 0426420 | 00000842 | 00000415 | ffffffff | ffffffff | 000003f4 | ffffffff | 0000074d | ffffffff | 000008f2 | ffffffff | ffffffff | 00000482 |
| 0426500 | 000006da | 0000064b | ffffffff | ffffffff | 00000975 | 0000032f | 00000903 | 000004a2 | ffffffff | 00000645 | 0000082f | ffffffff |
| 0426560 | 0000092b | 000002a5 | 0000060b | ffffffff | ffffffff | ffffffff | ffffffff | ffffffff | 00000948 | 00000826 | ffffffff | ffffffff |
| 0426640 | 00000739 | ffffffff | ffffffff | 0000043b | 00000579 | ffffffff | 00000545 | ffffffff | ffffffff | 00000914 | ffffffff | 00000743 |
| 0426720 | 00000180 | ffffffff | ffffffff | ffffffff | 00000365 | ffffffff | ffffffff | 000008de | 000000fe | ffffffff | ffffffff | 00000835 |
| 0427000 | 000004e9 | 000002fe | ffffffff | 000005c2 | 00000495 | ffffffff | 000007e2 | ffffffff | ffffffff | ffffffff | 00000939 | ffffffff |
| 0427060 | 00000320 | 000008ff | 00000588 | ffffffff | ffffffff | ffffffff | ffffffff | 000003d3 | 000008ed | 00000377 | 0000083d | ffffffff |
| 0427140 | 00000788 | ffffffff | 00000199 | 000003c9 | 00000902 | 000007ee | ffffffff | ffffffff | ffffffff | 00000753 | 000008bd | ffffffff |
| 0427220 | 000006be | ffffffff | 00000823 | ffffffff | ffffffff | ffffffff | 000007bb | ffffffff | 0000092e | 0000057a | ffffffff | ffffffff |
| 0427300 | ffffffff | 00000641 | ffffffff | ffffffff | 00000881 | 0000093c | 00000900 | ffffffff | ffffffff | 000008a4 | 000005cf | 00000741 |
| 0427360 | 000004c6 | 0000059f | 000004f7 | 0000050d | 000000dd | ffffffff | ffffffff | ffffffff | ffffffff | ffffffff | 000005cc | ffffffff |
| 0427440 | ffffffff | ffffffff | ffffffff | 00000525 | 000008f3 | 00000443 | 00000389 | ffffffff | 000005c9 | ffffffff | ffffffff | 00000536 |
| 0427520 | ffffffff | ffffffff | ffffffff | 00000312 | 000002a6 | 00000824 | ffffffff | ffffffff | 00000465 | 000007e5 | 000003de | ffffffff |

| | | | | | | | | | | | | |
|---|---|---|---|---|---|---|---|---|---|---|---|---|
| 0427600 | 00000533 | 00000800 | ffffffff | 0000034b | ffffffff | 0000047e | ffffffff | ffffffff | 0000037d | 0000036f | 000006f9 | ffffffff |
| 0427660 | ffffffff | ffffffff | ffffffff | ffffffff | ffffffff | 00000424 | ffffffff | ffffffff | 0000015c | ffffffff | ffffffff | 000006c2 |
| 0427740 | 0000012a | 00000134 | 00000606 | 000008c5 | 00000177 | ffffffff | 00000704 | ffffffff | 00000331 | 00000494 | 00000370 | ffffffff |
| 0430020 | 0000067a | ffffffff | ffffffff | 0000059a | ffffffff | ffffffff | ffffffff | ffffffff | ffffffff | 00000605 | 000007f2 | ffffffff |
| 0430100 | ffffffff | 00000469 | 00000561 | 000002e7 | 00000356 | 000004a0 | ffffffff | ffffffff | 000003af | 000008a2 | 000002be | ffffffff |
| 0430160 | ffffffff | 000008e8 | 00000877 | ffffffff | 00000538 | 000003c0 | 00000316 | ffffffff | ffffffff | ffffffff | 00000885 | 00000856 |
| 0430240 | 00000398 | 00000676 | ffffffff | ffffffff | 0000035d | ffffffff | 000007ec | ffffffff | ffffffff | ffffffff | 00000305 | 000005a1 |
| 0430320 | 0000069b | 00000883 | 000007df | ffffffff | ffffffff | ffffffff | 000007aa | 000001f3 | 000008b7 | ffffffff | 0000073c | 00000695 |
| 0430400 | ffffffff | 000006c0 | 000007c1 | 00000874 | ffffffff | 000004fc | ffffffff | ffffffff | 00000587 | ffffffff | 000007f1 | ffffffff |
| 0430460 | 00000655 | 0000067b | ffffffff | ffffffff | 000008f7 | 00000393 | ffffffff | ffffffff | 000007ed | 00000570 | 00000794 | 00000442 |
| 0430540 | 000003c3 | 00000294 | ffffffff | ffffffff | 00000712 | ffffffff | ffffffff | ffffffff | ffffffff | 00000470 | 00000302 | ffffffff |
| 0430620 | 00000748 | 000004ec | 0000045d | 00000200 | 000003fe | 000001f5 | ffffffff | ffffffff | 00000940 | 00000894 | 0000038f | 00000542 |
| 0430700 | ffffffff | 00000620 | 00000196 | ffffffff | 00000912 | ffffffff | ffffffff | 000006de | 0000056a | ffffffff | ffffffff | ffffffff |
| 0430760 | 0000050c | 0000085c | ffffffff | ffffffff | 000003fb | 00000368 | 000005b7 | 00000678 | 000006e2 | 0000097d | 000008be | ffffffff |
| 0431040 | ffffffff | ffffffff | 00000850 | 00000133 | 00000733 | ffffffff | 000008d5 | 000003d8 | ffffffff | 0000045f | 00000719 | ffffffff |
| 0431120 | 00000685 | 00000791 | ffffffff | 0000047b | ffffffff | ffffffff | 00000458 | ffffffff | 00000752 | 000006cf | 0000068b | 000002f6 |
| 0431200 | ffffffff | ffffffff | ffffffff | 00000870 | ffffffff | 000004f4 | 00000852 | 000006b2 | 0000087b | 000008ee | 000003f5 | ffffffff |
| 0431260 | 0000050e | 00000394 | ffffffff | ffffffff | ffffffff | ffffffff | 00000138 | 00000714 | 00000857 | ffffffff | 0000076a | ffffffff |
| 0431340 | 00000581 | ffffffff | 0000081e | ffffffff | ffffffff | ffffffff | 000002a8 | 00000585 | 000008c3 | 0000074a | ffffffff | 000001ee |
| 0431420 | 00000348 | 0000041d | ffffffff | ffffffff | ffffffff | ffffffff | 000006ff | ffffffff | ffffffff | 00000653 | 00000820 | 000007a8 |
| 0431500 | ffffffff | 000003cd | 00000471 | 000005d5 | 00000890 | 00000730 | 000007db | ffffffff | ffffffff | 00000621 | 0000065d | ffffffff |
| 0431560 | 000007ea | ffffffff | 00000584 | ffffffff | 00000454 | 000003ff | ffffffff | 000008b4 | 000002cf | 0000055c | 0000071e | 000006f8 |
| 0431640 | 0000089b | ffffffff | ffffffff | 0000034d | 00000822 | 00000401 | ffffffff | 0000068d | ffffffff | ffffffff | ffffffff | 000007b8 |
| 0431720 | 0000075f | 00000352 | ffffffff | ffffffff | 00000403 | 00000898 | 0000068c | ffffffff | 00000740 | ffffffff | ffffffff | ffffffff |
| 0432000 | ffffffff | 0000038e | ffffffff | ffffffff | ffffffff | ffffffff | ffffffff | 000003b9 | ffffffff | 000004e6 | ffffffff | ffffffff |
| 0432060 | 00000729 | 000006df | ffffffff | ffffffff | ffffffff | 0000062e | 000008b9 | ffffffff | ffffffff | ffffffff | 00000905 | 000007b4 |
| 0432140 | 00000406 | 000008e0 | 00000641 | ffffffff | 00000759 | 000001cf | 000005ff | 00000475 | 000005fc | ffffffff | 000007bc | ffffffff |
| 0432220 | ffffffff | 0000042a | ffffffff | ffffffff | 00000519 | 00000607 | 000004b1 | 0000078b | ffffffff | 00000652 | 000001c9 | ffffffff |
| 0432300 | 00000476 | ffffffff | 0000090d | ffffffff | 0000016c | ffffffff | ffffffff | ffffffff | ffffffff | ffffffff | 0000066e | 0000052c |
| 0432360 | ffffffff | 00000300 | ffffffff | 00000796 | ffffffff | ffffffff | 000006e1 | ffffffff | ffffffff | 000008a6 | ffffffff | 000007fe |
| 0432440 | 00000551 | 000001ce | ffffffff | ffffffff | 0000076c | ffffffff | 000001f9 | 000008da | ffffffff | ffffffff | 0000066c | ffffffff |
| 0432520 | 000004ef | 0000072d | 0000083c | ffffffff | ffffffff | ffffffff | 00000136 | 00000528 | 000008e6 | 000004b6 | 00000977 | 0000086d |
| 0432600 | 00000572 | 000004a9 | 0000054b | ffffffff | 0000051a | ffffffff | 0000086c | ffffffff | ffffffff | ffffffff | 00000381 | ffffffff |
| 0432660 | ffffffff | 00000795 | 000006e9 | ffffffff | ffffffff | 000006ac | 00000558 | ffffffff | ffffffff | 000003a4 | 000007de | ffffffff |
| 0432740 | 000004e8 | 000004e7 | 00000633 | 00000849 | 000006d8 | 000007e9 | ffffffff | 00000412 | 00000801 | 00000530 | 00000104 | ffffffff |
| 0433020 | ffffffff | ffffffff | 00000142 | ffffffff | ffffffff | 00000575 | 00000930 | 0000059b | 000008d9 | 00000697 | 000003bb | ffffffff |
| 0433100 | ffffffff | 0000081f | ffffffff | 000003bd | 0000084f | 00000776 | 000002f2 | ffffffff | 00000917 | 000005f6 | ffffffff | ffffffff |
| 0433160 | 00000843 | 00000488 | 000008f9 | 000006a6 | 00000773 | ffffffff | 000005d1 | 000008d8 | ffffffff | ffffffff | ffffffff | ffffffff |
| 0433240 | ffffffff | 000005f3 | ffffffff | ffffffff | 00000667 | 000001dc | 00000701 | 0000034c | 000001e0 | ffffffff | 000004f9 | 000008c1 |
| 0433320 | 000008c4 | 00000534 | 00000845 | 00000466 | ffffffff | ffffffff | ffffffff | ffffffff | 00000290 | 000006a9 | ffffffff | 00000907 |
| 0433400 | 0000038c | ffffffff | ffffffff | ffffffff | 00000625 | 000008fc | 000001c1 | 0000067f | 000008aa | ffffffff | ffffffff | ffffffff |
| 0433460 | 00000926 | 00000491 | ffffffff | ffffffff | 000008ea | 0000083b | 000003e2 | ffffffff | 00000174 | 000007ff | ffffffff | ffffffff |
| 0433540 | ffffffff | 00000622 | ffffffff | ffffffff | 0000086b | ffffffff | 000007eb | ffffffff | 00000901 | 0000046f | 000007cd | 00000291 |
| 0433620 | ffffffff | 000006bf | 000006f1 | 000006f5 | 000006fa | 000006fc | 000006af | ffffffff | 00000565 | 0000067c | ffffffff | 00000727 |
| 0433700 | 0000041f | 000003ec | ffffffff | 00000541 | 000005fa | 00000804 | 00000325 | 0000060a | 000003f0 | ffffffff | ffffffff | 00000631 |
| 0433760 | 00000632 | 00000425 | 00000705 | ffffffff | 000005e6 | 00000108 | 000008d3 | 00000684 | ffffffff | 0000056e | 000007f8 | ffffffff |
| 0434040 | 0000086f | ffffffff | ffffffff | ffffffff | ffffffff | 000007af | 00000573 | ffffffff | ffffffff | 0000060e | 0000087c | 0000049f |
| 0434120 | 000006cd | 000004a7 | 00000662 | 000004d3 | 000004a1 | ffffffff | ffffffff | 0000047c | ffffffff | 0000033a | 00000682 | 000002ea |
| 0434200 | ffffffff | 0000038a | 000007c3 | 0000080d | ffffffff | 000008b8 | 0000043f | 00000766 | 00000405 | ffffffff | 000006f7 | 00000463 |
| 0434260 | 000001bb | ffffffff | 0000091c | ffffffff | ffffffff | 0000048e | 000001c6 | 00000604 | ffffffff | 0000097c | 000004fa | ffffffff |
| 0434340 | ffffffff | 00000650 | 00000767 | 0000050a | ffffffff | 000004ae | 000005b6 | 00000474 | 00000919 | ffffffff | ffffffff | ffffffff |
| 0434420 | 00000513 | 0000069f | 000002bd | ffffffff | 000004a3 | ffffffff | 00000762 | ffffffff | 0000074c | 0000050b | ffffffff | 000005fe |
| 0434500 | 000006db | 00000847 | 00000483 | ffffffff | 00000143 | 000008cf | ffffffff | ffffffff | 000006a2 | 00000757 | 000004b3 | ffffffff |
| 0434560 | 0000061e | ffffffff | 00000548 | ffffffff | ffffffff | 00000505 | 000006aa | ffffffff | 00000942 | 00000549 | 0000051f | ffffffff |
| 0434640 | 00000782 | 0000060d | 00000863 | ffffffff | 00000915 | 000006dd | 0000054d | ffffffff | 000006ab | 00000832 | 0000028d | 00000790 |

| | | | | | | | | | | | | |
|---|---|---|---|---|---|---|---|---|---|---|---|---|
| 0434720 | 00000696 | 0000072a | 00000793 | ffffffff | 00000552 | 00000543 | ffffffff | 00000521 | 0000074f | 0000049a | ffffffff | ffffffff |
| 0435000 | ffffffff | 000004e0 | 000006b8 | 000003ef | ffffffff | 0000070e | 000008fb | 00000547 | 000008d7 | 000002c1 | 0000093f | ffffffff |
| 0435060 | 0000072b | 0000041b | 0000077a | ffffffff | 00000580 | ffffffff | 0000013b | ffffffff | 0000040e | 0000082b | ffffffff | 0000055f |
| 0435140 | ffffffff | 0000077d | ffffffff | ffffffff | 0000059c | ffffffff | ffffffff | 00000873 | ffffffff | ffffffff | 000001cb | 00000731 |
| 0435220 | ffffffff | 0000049e | ffffffff | 00000520 | ffffffff | 000006a5 | 000002ce | ffffffff | 00000892 | 00000395 | 00000848 | 000007b0 |
| 0435300 | ffffffff | ffffffff | ffffffff | 000005d6 | ffffffff | 000002d1 | 00000875 | ffffffff | ffffffff | ffffffff | ffffffff | ffffffff |
| 0435360 | ffffffff | ffffffff | ffffffff | 000007d0 | 000008fe | 000001ef | 000007c5 | 000002b9 | 0000036a | ffffffff | ffffffff | ffffffff |
| 0435440 | 00000539 | ffffffff | 000008af | ffffffff | ffffffff | 00000346 | ffffffff | ffffffff | 000006c1 | 00000327 | ffffffff | ffffffff |
| 0435520 | ffffffff | 000004ff | 000007b9 | ffffffff | 0000076b | 000008f5 | 00000529 | 000004c8 | 00000329 | 000004fe | ffffffff | 000004fb |
| 0435600 | ffffffff | ffffffff | 000007be | 0000085d | ffffffff | 000006c5 | ffffffff | ffffffff | ffffffff | ffffffff | 00000670 | ffffffff |
| 0435660 | 000007ef | 0000087e | ffffffff | 000005ec | ffffffff | ffffffff | ffffffff | ffffffff | ffffffff | 000004bf | 00000818 | ffffffff |
| 0435740 | ffffffff | 0000085e | ffffffff | ffffffff | 00000574 | 000001ed | ffffffff | ffffffff | ffffffff | ffffffff | ffffffff | ffffffff |
| 0436020 | ffffffff | ffffffff | ffffffff | ffffffff | ffffffff | ffffffff | ffffffff | 000004bd | 0000070f | ffffffff | ffffffff | ffffffff |
| 0436100 | ffffffff | 0000068a | 000005b5 | ffffffff | 00000160 | 00000698 | ffffffff | ffffffff | ffffffff | ffffffff | 0000085b | ffffffff |
| 0436160 | ffffffff | 0000084e | ffffffff | ffffffff | 000008f0 | 0000088d | ffffffff | ffffffff | ffffffff | 00000978 | ffffffff | ffffffff |
| 0436240 | 000008a8 | 000008ef | ffffffff | ffffffff | ffffffff | 000001d4 | 00000844 | ffffffff | ffffffff | 00000453 | ffffffff | 00000893 |
| 0436320 | 00000868 | 000005cb | ffffffff | 0000058f | ffffffff | ffffffff | ffffffff | ffffffff | 000003a1 | 00000364 | ffffffff | 000004e5 |
| 0436400 | 000005bc | 0000085f | ffffffff | ffffffff | 0000016e | ffffffff | ffffffff | ffffffff | ffffffff | ffffffff | ffffffff | 000005e4 |
| 0436460 | 00000949 | ffffffff | ffffffff | 000008db | ffffffff | 00000296 | 000002aa | ffffffff | 0000017b | 0000072c | 00000811 | ffffffff |
| 0436540 | ffffffff | 00000427 | ffffffff | ffffffff | ffffffff | 0000058e | ffffffff | ffffffff | ffffffff | 000007d5 | ffffffff | ffffffff |
| 0436620 | ffffffff | ffffffff | ffffffff | ffffffff | 000006d1 | ffffffff | 000005d4 | 00000799 | 0000079d | 00000619 | ffffffff | ffffffff |
| 0436700 | ffffffff | ffffffff | ffffffff | 00000744 | ffffffff | 00000964 | 000004dc | 0000035e | 0000056c | ffffffff | ffffffff | ffffffff |
| 0436760 | ffffffff | 00000865 | 000005e1 | ffffffff | 00000871 | 0000059b | 0000057b | 000004d9 | 00000169 | ffffffff | 000001ba | 00000910 |
| 0437040 | ffffffff | 00000908 | 00000939 | 0000072e | ffffffff | 00000777 | 00000876 | ffffffff | ffffffff | ffffffff | 0000052e | 00000e96 |
| 0437120 | 00000190 | ffffffff | 00000815 | ffffffff | ffffffff | 00000888 | ffffffff | ffffffff | 000006cb | 00000442 | 000002a4 | 00000879 |
| 0437200 | 00000778 | ffffffff | ffffffff | ffffffff | ffffffff | ffffffff | ffffffff | ffffffff | 00000590 | ffffffff | ffffffff | ffffffff |
| 0437260 | 00000657 | ffffffff | ffffffff | ffffffff | 0000053e | 00000946 | ffffffff | ffffffff | 00000755 | ffffffff | ffffffff | ffffffff |
| 0437340 | ffffffff | ffffffff | 0000075d | ffffffff | ffffffff | 000007e3 | 000008f8 | ffffffff | 0000052f | 0000051d | ffffffff | ffffffff |
| 0437420 | ffffffff | ffffffff | 00000144 | ffffffff | 00000781 | ffffffff | 0000030b | ffffffff | ffffffff | ffffffff | 0000044f | ffffffff |
| 0437500 | ffffffff | ffffffff | ffffffff | 000004bb | 00000649 | 0000072f | ffffffff | ffffffff | ffffffff | ffffffff | ffffffff | ffffffff |
| 0437560 | 0000045a | ffffffff | ffffffff | ffffffff | 0007f43c | 0007f45c | 0007f49c | ffffffff | 000cf218 | 000cf238 | 000cf258 | 000cf2bc |
| 0437640 | ffffffff | 000cf360 | ffffffff | 0007f4dc | 000eb304 | 0007f4fc | 000cf4dc | 000cf5a4 | 000cf5c4 | 000cf62c | 000cf7c8 | 000cf854 |
| 0437720 | 000cf874 | 000d50ac | 000cf980 | 000cfa1c | 000cfa88 | 000cfb24 | 000cfb44 | 000cfb64 | 000cfb84 | 000cfbc4 | 000cfc34 | 000cfd54 |
| 0440000 | 000cfec8 | 000cfee8 | 000cff08 | 000cff28 | 00010000 | ffffffff | 0007f65c | 000d0080 | 000d013c | 000d015c | 0007f67c | ffffffff |
| 0440060 | 000f1f88 | 000f1f1c | 000d0580 | 000a2550 | 000a1c1c | 000a1938 | 000a1958 | 000c20bc | 000d27f0 | 000d2830 | 000d2850 | 000d2870 |
| 0440140 | 000d28b4 | 000d28d4 | 000d2940 | 000d2960 | 000d2a18 | 000d2a60 | 000d2a80 | 000c8ea8 | ffffffff | 000a19c0 | 000d29a8 | 000d4b00 |
| 0440220 | 000d4b44 | 000d4b88 | 000d4bec | 000d4c0c | 000d4d98 | 000d4e0c | 000d4c78 | 000a686c | ffffffff | 000d503c | 000d50cc | ffffffff |
| 0440300 | ffffffff | ffffffff | 000d7324 | 000d7388 | 000d73cc | 000d73ec | 000d76d4 | ffffffff | 0007f81c | ffffffff | ffffffff | 000cfe88 |
| 0440360 | 000d7820 | 000d78d8 | 000d79d0 | 000d79f0 | 000d7bcc | 000d7c2c | 000d7cb0 | 000d7ce8 | 000d7dac | 000d7dcc | 000d7e3c | ffffffff |
| 0440440 | ffffffff | 0007f99c | 0007f9fc | ffffffff | 000da130 | 000da150 | 000d7368 | 000da1c0 | 000da1e0 | 000da23c | 000da25c | 000da27c |
| 0440520 | 000da29c | 000da320 | 000da340 | 000da360 | 000da398 | 000da3e4 | 000da494 | ffffffff | ffffffff | ffffffff | 000da504 | 0007fb1c |
| 0440600 | 0007fb3c | 000da5ec | 000da60c | 000da5cc | 000da90c | 000da980 | 000daa9c | ffffffff | ffffffff | 000dad4c | 000dad7c | 000dad9c |
| 0440660 | 000daf48 | 000daf68 | 0007fb9c | 0007e91c | 0007fbdc | ffffffff | 000dd458 | 000dd4b4 | 000dd4d4 | 000dd530 | 000d4dec | 000c9c44 |
| 0440740 | ffffffff | 000df9f8 | 000dd5a0 | 0007fc5c | 000df5f8 | 0007fc9c | 000df618 | 000df678 | ffffffff | 000df6dc | 0007fcdc | 000df73c |
| 0441020 | 0007fd1c | 000eb1b0 | 000e8d20 | 000df7a4 | 000df7d8 | 000df838 | 000df89c | 000df6bc | 000df8bc | 000df9a4 | 000dfa58 | 000dfac0 |
| 0441100 | 000dfbac | 000b4e18 | 000dfc28 | 000dfdac | 000dfdcc | 000b771c | 000b7770 | 000dff74 | 000b77e8 | 000b7964 | 000e00d4 | 000e0160 |
| 0441160 | 000e0214 | 000e0234 | 000b7a04 | 000b7a24 | 000b7a6c | 000bd910 | 000b7aac | 000b9158 | 000e2668 | 000e2688 | 000e26cc | 000e26ec |
| 0441240 | 000e277c | 000b7e04 | 000b7e24 | 000b9250 | 000e275c | 000b7f70 | 000b8048 | 000d7e5c | ffffffff | 000da4b4 | 000e691c | ffffffff |
| 0441320 | ffffffff | 000e6960 | 000e6980 | 000e6a0c | 000e6a2c | 000d79b0 | 000cf088 | 000cf0c8 | 0008007c | 000e6a4c | 000e8cac | 000800dc |
| 0441400 | 000dacbc | ffffffff | 000d04ec | 000cc8b0 | ffffffff | ffffffff | ffffffff | 000a0dd8 | 000d7f58 | 000d7f04 | 000d802c | 000b84a8 |
| 0441460 | 000eb170 | 000eb1d0 | 000b8800 | 000b87b0 | 000eb29c | 000eb2bc | 000b89ac | 000b89cc | 000b89ec | 000b8aa0 | 000b8ac0 | 000b8b0c |
| 0441540 | 000ed41c | 000ed478 | 000ed4ec | 000b8bdc | 000f4828 | 000ed594 | 000ed5b4 | 000b8cf4 | 000b8d14 | 000ed674 | 000ed574 | 000ed7dc |
| 0441620 | 000ed864 | 000ed8e4 | 000ed924 | 000b9220 | 000ed9a8 | 000eda54 | ffffffff | 0008049c | ffffffff | 000efaf8 | ffffffff | ffffffff |
| 0441700 | 000be20c | 000bf9f0 | 000bfa20 | 000bfa50 | 000bfa80 | 000bfab0 | 000f1b24 | 000bfb80 | 000bfbb0 | 000bfbe0 | 000bfc10 | 000bfc40 |
| 0441760 | 000bfc70 | 000bfca0 | 000bfcd0 | 000bfd00 | 000bfd30 | 000bfd60 | 000bfd90 | 000bfdc0 | 000bfdf0 | 000bfe30 | 0008069c | 000bda68 |

```
0442040  000bdb38 ffffffff 0008071c ffffffff 000c2290 000c22b0 000c22d0 000c22f0 000c2310 000c2154 0008075c ffffffff
0442120  000c2194 000c2358 ffffffff 0008079c 000807dc ffffffff ffffffff ffffffff 000f1e5c 000807fc 000f1f3c 0008083c
0442200  ffffffff 000f1fc4 000f2004 ffffffff 0008089c ffffffff 000c64e4 000c651c 000c657c 000d7800 000c660c 000c6654
0442260  000c66b0 000d72c4 000c6758 ffffffff ffffffff ffffffff 0008091c 000c8790 000c87d0 000c8810 000c887c 0008095c
0442340  000f49a4 0008097c ffffffff 000c8904 ffffffff ffffffff 000c8984 000809bc 000c89e8 000c8a58 000c8ad0 000d7304
0442420  000d7528 000d78b8 000d7548 000d72e4 000c8934 000c8ba4 000c8bec 0007eb5c 000c8c30 000c8d08 000d2810 0007ebdc
0442500  0007ec1c ffffffff 0007ec3c ffffffff 000c8dec 0007ec7c ffffffff 00080b1c 00080b3c 00080b5c 000c8e1c 000c8f24
0442560  000c8f54 000c8f84 000c90b4 000c90ec 000c913c 000c91dc 000c9260 000c9290 000c92fc ffffffff 00080c1c 000c950c
0442640  000c95cc 000c96dc 000cfba4 000cf0e8 000c9798 0007ed5c ffffffff 000c9854 000c9918 00080cdc ffffffff ffffffff
0442720  ffffffff 000c9964 ffffffff 000c99a0 000c99f4 000c9a60 ffffffff 000c9a90 000b79a8 000c9ad0 000c9b54 000c9b9c
0443000  000c9c14 00080d9c 000c9ce4 00080dbc 0007e71c 0007e73c 000c9d14 000f4d40 000c9d74 000c9da4 0007ee9c 0007e7fc
0443060  ffffffff ffffffff 000c9f08 0007eebc 0007e85c 000c9f28 0007e89c ffffffff 000c9f48 0007ef3c 0007ef5c 000c9f68
0443140  0007ef9c 000c9f88 0007effc 0007f01c 0007f05c 0007f0bc ffffffff ffffffff 0007f0dc 0007f0fc 0007f11c 0007f13c
0443220  0007f15c ffffffff 000b7b48 ffffffff ffffffff 0007f17c 0007f19c ffffffff 000ca1d8 0007f1bc ffffffff ffffffff
0443300  ffffffff ffffffff 000cc59c 000cc5dc 000cc5fc 000cc61c ffffffff 0007f1dc 000cc690 000cc6b0 000cc6f4 000cc73c
0443360  000cc75c 000cc77c 000cc79c 000cc7d0 000cc7f0 000cc810 000cc830 000cc890 000cc8d0 ffffffff 000f1e14 000cc950
0443440  000cc970 000cc9b8 ffffffff ffffffff ffffffff 0007f2bc 000ceadc 000ceafc 000ceb1c 0007f35c 0007f37c 000ceb9c
0443520  000cebbc 000cec30 000cec50 000cec88 000ced00 000ced58 000cedac 000cefbc 000cede4 000cf0a8 ffffffff ffffffff
0443600  00080ddc ffffffff ffffffff ffffffff ffffffff ffffffff ffffffff ffffffff ffffffff ffffffff ffffffff ffffffff
0443660  ffffffff ffffffff ffffffff ffffffff ffffffff ffffffff ffffffff ffffffff ffffffff ffffffff ffffffff ffffffff
*
0445560  ffffffff ffffffff ffffffff ffffffff 0000097f bfb00000 0007e60c 27f00000 000939fa 2520247c 0007f3ec 000c7480
0445640  00000000 000939e8 000939e8 261c2794 b610bd04 0007e5ac 0000005c 00000000 00000000 00000000 00000000 00000000
0445720  00000000 00000001 00000000 00000001 00000001 00000000 00000000 00000000 00000000 00000000 0000000f 00000001
0446000  000186a0 00000000 00000001 00000000 00000000 00000000 00000000 00000000 00000000 0000075c 0009a058 00000000
0446060  00000000 00000001 00000001 0000000a 00000000 0000000f 00000000 00000001 00000049 00000000 00000000 00002d8f
0446140  00000000 00000000 00000001 00000001 00000000 00000000 0002438a 00000000 00000000 00000000 00000000 00000000
0446220  00000000 00100000 00000001 3f800000 3f800000 0007ea4c 0007f22c 0008032c 000803cc 0007f3ec 0007e60c 0007e5ac
0446300  00000000 00000000 00000000 000f2014 00080c4c 0007f60c 0007e92c 00000000 0002438a 000939e0 000939e0 00093a0e
0446360  00093a00 00000000 00000000 00000000 00000000 00000000 00000001 00000000 000939e8 000939f4 00090ddc 00073e98
0446440  0000005f 00000001 00000001 000a4685 00000000 00000000 00000000 00000000 00093d54 00093cfc 00093d64 00093d74
0446520  00093d84 00093ce5 00093da4 00093db4 00093d3d 00093e04 00000000 000a1b80 00000000 00000000 00000000 00000000
0446600  00000000 00000000 00093e14 00000000 00000000 00093e24 00093cf5 00093cad 00000000 00000000 00000000 00000000
0446660  00093e64 00093e74 00093e84 00093e94 00093ea4 00093eb4 00093ec4 00093ed4 00093ee4 00093cd5 00093f24 00093f34
0446740  00000000 00093f44 00093f54 00093f64 00093f74 00093f84 00000000 00000000 00093f94 00000000 00000000 00000000
0447020  00000000 00000000 00000000 000a17a0 000a1790 000a16b8 000a15e8 00000ce7 b4640000 0006f494 00093c98 b4640000
0447100  0006f4f4 00000000 00093e54 00000000 00093c88 00093ca4 00093f14 00000000 00093f04 00093cb4 00093de4 00093d34
0447160  00093dd4 00093cc4 00093ef4 00093cbc 00093d94 00000000 00093d18 00093cdc 00093e44 00000000 00093e34 00093cec
0447240  00000a37 b4640000 0006fa64 00093d0c b4640000 0006fb24 00000000 00000a57 b4640000 0006fa94 00093d28 b4640000
0447320  0006fb54 00000000 00093df4 00000000 00093dc4 00093ccc 00000a07 b3280000 0006fbe4 00000000 0000242f b3280000
0447400  0006f614 00000000 00000a3f b3280000 0006f6a4 00000000 00001647 b3280000 0006f6d4 00000000 0000164f b3280000
0447460  0006fac4 00000000 00001657 b3280000 0006f824 00000000 00000a5f b3280000 0006f4c4 00000000 00000a67 b3280000
0447540  0006f674 00000000 0000166f b3280000 0006fca4 00000000 00001e6f b3280000 0006f5b4 00000000 0000226f b3280000
0447620  0006f794 00000000 0000246f b3280000 0006fc74 00000000 00002477 b3280000 0006f554 00000000 00000abf b3280000
0447700  0006fb84 00000000 00000ad7 b3280000 0006fbb4 00000000 00000adf b3280000 0006faf4 00000000 00000cdf b3280000
0447760  0006fa34 00000000 000024e7 b3280000 0006f5e4 00000000 00000d0f b3280000 0006f644 00000000 00000d17 b3280000
0450040  0006f974 00000000 00000d1f b3280000 0006fc14 00000000 00000d27 b3280000 0006f764 00000000 00000d2f b3280000
0450120  0006f7c4 00000000 00000d37 b3280000 0006f914 00000000 00000d3f b3280000 0006f9d4 00000000 00000d47 b3280000
0450200  0006f7f4 00000000 00000d4f b3280000 0006f944 00000000 00000d57 b3280000 0006f9a4 00000000 00002757 b3280000
0450260  0006f584 00000000 00002957 b3280000 0006f704 00000000 00000d5f b3280000 0006fa04 00000000 00000d67 b3280000
0450340  0006fc44 00000000 00000d77 b3280000 0006f524 00000000 00000d7f b3280000 0006f854 00000000 00000d87 b3280000
0450420  0006f8b4 00000000 00000d8f b3280000 0006f884 00000000 00000d97 b3280000 0006f8e4 00000000 000025b7 b3280000
0450500  0006f734 00000000 00000000 00000000 00094170 00000000 00094180 00000000 00000000 00000000 00000000 00000000
0450560  00000000 00000000 000a1501 000941a0 00000000 00000000 00000000 00000000 00000000 00000000 00000000 00094105
0450640  00000000 00094135 00094210 00000000 00000000 00000000 00094220 00094230 00000000 00094240 00000000 00000000
```

| | | | | | | | | | | | | |
|---|---|---|---|---|---|---|---|---|---|---|---|---|
| 0450720 | 00000000 | 000940f5 | 00000000 | 00000000 | 00094115 | 00000000 | 000a12ec | 00000000 | 0009412d | 00000000 | 00000000 | 00000000 |
| 0451000 | 000940c5 | 000940d5 | 000940e5 | 00000000 | 00000000 | 00000000 | 00094340 | 00094350 | 00094360 | 00000000 | 00000000 | 00000000 |
| 0451060 | 00000000 | 00000000 | 00094370 | 00094380 | 00094145 | 00000000 | 000941f0 | 000940b4 | 000941e0 | 000940a4 | 00094200 | 00000000 |
| 0451140 | 000942e0 | 00000000 | 000942d0 | 000940bc | 00094310 | 00000000 | 000942f0 | 0009411c | 00094330 | 00000000 | 00094320 | 000940dc |
| 0451220 | 00094260 | 00000000 | 00094250 | 000940ec | 000941c0 | 00000000 | 000941b0 | 000940fc | 00094280 | 00000000 | 00094270 | 0009410c |
| 0451300 | 00094300 | 000940cc | 000942a0 | 00094154 | 00094290 | 00094124 | 000941d0 | 000940ac | 000943a0 | 0009414c | 00094390 | 0009413c |
| 0451360 | 000943b0 | 00000000 | 000942b0 | 0009415c | 000942c0 | 00000000 | b3280000 | 00073c3c | 00000000 | 01002817 | b3280000 | 00073a10 |
| 0451440 | 00000000 | 01002827 | b3280000 | 00073a40 | 00000000 | 01001c67 | b3280000 | 000736dc | 00000000 | 0200166f | b3280000 | 0007373c |
| 0451520 | 00000000 | 01001aaf | b3280000 | 00073adc | 00000000 | 02001aaf | b3280000 | 00073b0c | 00000000 | 01001ebf | b3280000 | 00073ca0 |
| 0451600 | 00000000 | 020026bf | b3280000 | 000737d0 | 00000000 | 030026bf | b3280000 | 00073804 | 00000000 | 030028bf | b3280000 | 0007383c |
| 0451660 | 00000000 | 040008c7 | b3280000 | 00073e10 | 00000000 | 030008e7 | b3280000 | 00073dd8 | 00000000 | 010024ef | b3280000 | 00073e4c |
| 0451740 | 00000000 | 020026ff | b3280000 | 00073ba8 | 00000000 | 02001d1f | b3280000 | 00073a70 | 00000000 | 03001d1f | b3280000 | 00073aa4 |
| 0452020 | 00000000 | 01002337 | b3280000 | 00073bdc | 00000000 | 02002937 | b3280000 | 00073b74 | 00000000 | 01001d57 | b3280000 | 00073c70 |
| 0452100 | 00000000 | 01002957 | b3280000 | 00073770 | 00000000 | 02002357 | b3280000 | 00073d6c | 00000000 | 03002357 | b3280000 | 00073da0 |
| 0452160 | 00000000 | 01001b77 | b3280000 | 000738e4 | 00000000 | 02001b77 | b3280000 | 00073914 | 00000000 | 01001b7f | b3280000 | 00073948 |
| 0452240 | 00000000 | 01001d7f | b3280000 | 00073c0c | 00000000 | 02001b7f | b3280000 | 00073978 | 00000000 | 01001b87 | b3280000 | 000739ac |
| 0452320 | 00000000 | 02001b87 | b3280000 | 000739dc | 00000000 | 03001fa7 | b3280000 | 000738ac | 00000000 | 010021af | b3280000 | 0007370c |
| 0452400 | 00000000 | 010025b7 | b3280000 | 000737a0 | 00000000 | 02001de7 | b3280000 | 00073b40 | 00000000 | 03001bef | b3280000 | 00073874 |
| 0452460 | 00000000 | 01002bf7 | b3280000 | 00073cd0 | 00000000 | 02002bf7 | b3280000 | 00073d00 | 00000000 | 03002bf7 | b3280000 | 00073d34 |
| 0452540 | 00000000 | 000943f0 | 00094400 | 00094410 | 000943e9 | 00000000 | 00000000 | 00094440 | 00000000 | 00094430 | 00000000 | 00094420 |
| 0452620 | 000943e0 | 00002307 | b3280000 | 00070694 | 00000000 | 000026cf | b3280000 | 000706fc | 00000000 | 00002c17 | b3280000 | 00070798 |
| 0452700 | 00000000 | 00002a5f | b3280000 | 00070730 | 00000000 | 00002c1f | b3280000 | 00070764 | 00000000 | 00001f77 | b3280000 | 000706c8 |
| 0452760 | 00000000 | 00094e41 | 00094eec | 00094ba5 | 00000000 | 00094f0c | 00000000 | 00094bb5 | 00094f3c | 00000000 | 00000000 | 00000000 |
| 0453040 | 00094bc5 | 00000000 | 00094bf1 | 00000000 | 00000000 | 000b87f0 | 000bd649 | 000bd659 | 000bd661 | 000bd669 | 000b7fdc | 000bd6b1 |
| 0453120 | 000bd6d9 | 000bd701 | 000bd731 | 000bd761 | 000bd791 | 000bd7c1 | 000bd7f1 | 000bd821 | 000bd849 | 000b7a5c | 000b78b4 | 000b7854 |
| 0453200 | 000bd8d9 | 000bd909 | 0009cf08 | 00094c44 | 00000000 | 00000000 | 00000000 | 0009509c | 00000000 | 000be0d4 | 000be040 | 000be000 |
| 0453260 | 000be109 | 000bdf48 | 00000000 | 00094c60 | 00000000 | 00000000 | 000950ac | 00000000 | 000950bc | 00094c7c | 00000000 | 00000000 |
| 0453340 | 000950cc | 00000000 | 00094ca1 | 000950fc | 0009510c | 00000000 | 00000000 | 00000000 | 00000000 | 00094ca8 | 00000000 | 0009511c |
| 0453420 | 00094e51 | 00000000 | 00000000 | 00000000 | 0009514c | 0009515c | 0009516c | 00000000 | 00000000 | 00000000 | 00000000 | 0009517c |
| 0453500 | 00000000 | 00000000 | 00094991 | 0009519c | 000951ac | 000951bc | 000951cc | 00000000 | 000951dc | 00000000 | 00000000 | 000951ec |
| 0453560 | 000951fc | 0009520c | 0009521c | 000949a1 | 0009525c | 0009526c | 0009527c | 00094cd5 | 0009529c | 000a100d | 00000000 | 000949c4 |
| 0453640 | 000952bc | 00000000 | 00000000 | 0009486c | 00094888 | 000948a4 | 00000000 | 000952cc | 000952dc | 000952ec | 000952fc | 00000000 |
| 0453720 | 0009530c | 0009531c | 00000000 | 000949e0 | 00000000 | 00000000 | 0009532c | 00094cdc | 00000000 | 0009533c | 00000000 | 0009534c |
| 0454000 | 000948c9 | 00000000 | 0009537c | 00000000 | 00000000 | 00000000 | 00000000 | 0009538c | 00000000 | 0009539c | 00000000 | 000953ac |
| 0454060 | 00000000 | 00094d0d | 00094d30 | 00000000 | 00000000 | 00000000 | 00000000 | 00000000 | 00000000 | 00000000 | 00000000 | 00000000 |
| 0454140 | 000953bc | 00094e81 | 00094d55 | 00000000 | 00094a21 | 00094d94 | 00094e61 | 0009541c | 000948d0 | 00094df9 | 0009543c | 00094dc9 |
| 0454220 | 0009546c | 00094e09 | 0009549c | 00094dd9 | 00094de9 | 000954ec | 000954fc | 00094e71 | 00094e11 | 0009555c | 00094e21 | 00094e31 |
| 0454300 | 00000000 | 000948f5 | 00000000 | 00094a5d | 00094a6d | 0009560c | 00094a7d | 0009562c | 0009563c | 00094a8d | 00094a9d | 0009568c |
| 0454360 | 00000000 | 0009569c | 000bd939 | 00000000 | 000bd639 | 000b7f90 | 00000000 | 00000000 | 00000000 | 000956cc | 00094aad | 000956fc |
| 0454440 | 0009570c | 0009571c | 00094db9 | 00000000 | 0009574c | 00000000 | 00000000 | 00000000 | 00000000 | 00000000 | 00000000 | 00000000 |
| 0454520 | 00094abd | 00094ae9 | 0009578c | 0009579c | 00000000 | 00000000 | 000957ac | 00000000 | 000957bc | 00000000 | 00000000 | 000957cc |
| 0454600 | 00094af0 | 00000000 | 00000000 | 00000000 | 00094b0c | 000957dc | 00094b31 | 0009580c | 00094b38 | 00000000 | 00000000 | 0009581c |
| 0454660 | 0009582c | 00000000 | 00000000 | 00000000 | 00094b54 | 0009583c | 0009584c | 0009585c | 00094b79 | 0009588c | 0009589c | 00000000 |
| 0454740 | 000958ac | 000958bc | 000958cc | 00000000 | 00094b80 | 00001aaf | b4640000 | 00070998 | 00094860 | b4640000 | 000709cc | 00000000 |
| 0455020 | 00001b77 | b4640000 | 00070ad0 | 0009487c | b4640000 | 00070b04 | 00000000 | 00001b7f | b4640000 | 00070b38 | 00094898 | b4640000 |
| 0455100 | 00070b6c | 00000000 | 00001b87 | b4640000 | 00070ba0 | 000948b4 | b4640000 | 00070bd4 | 00000000 | 0009536c | 00000000 | 0009535c |
| 0455160 | 000948c0 | 00001d1f | b4640000 | 00070da8 | 000948e0 | b4640000 | 00070ddc | 00000000 | 000955bc | 00000000 | 000955ac | 000948ec |
| 0455240 | 00001dcf | b4640000 | 00070fe4 | 0009490c | b4640000 | 00071018 | 00000000 | 00002017 | b4640000 | 000713f4 | 00094928 | b4640000 |
| 0455320 | 00071428 | 00000000 | 000020bf | b4640000 | 0007152c | 00094944 | b4640000 | 00071560 | 00000000 | 000020c7 | b4640000 | 00071594 |
| 0455400 | 00094960 | b4640000 | 000715c8 | 00000000 | 0000211f | b4640000 | 00071630 | 0009497c | b4640000 | 00071664 | 00000000 | 0009518c |
| 0455460 | 00000000 | 00094850 | 00094988 | 0009523c | 00094cc4 | 0009522c | 00094998 | 00002337 | b4640000 | 0007186c | 000949b8 | b4640000 |
| 0455540 | 000718a0 | 00000000 | 00002357 | b4640000 | 000718d4 | 000949d4 | b4640000 | 00071908 | 00000000 | 000023d7 | b4640000 | 00071970 |
| 0455620 | 000949f0 | b4640000 | 000719a4 | 00000000 | 00002487 | b4640000 | 00071a74 | 00094a0c | b4640000 | 00071aa8 | 00000000 | 000953fc |
| 0455700 | 00000000 | 000953ec | 00094a18 | 00002527 | b4640000 | 00071b78 | 00094a38 | b4640000 | 00071bac | 00000000 | 0009554c | 00000000 |
| 0455760 | 0009553c | 00094a44 | 000955dc | 00000000 | 000955cc | 00094a54 | 000955fc | 00000000 | 000955ec | 00094a64 | 0009561c | 00000000 |

0456040 000948fc 00094a74 0009565c 00000000 0009564c 00094a84 0009567c 00000000 0009566c 00094a94 000956ec 00000000
0456120 000956dc 00094aa4 00094ac4 00000000 0009575c 00094ab4 000026bf b4640000 00071f20 00094ad4 b4640000 00071f54
0456200 00000000 0009577c 00000000 0009576c 00094ae0 0000271f b4640000 00072024 00094b00 b4640000 00072058 00000000
0456260 0000273f b4640000 0007208c 00094b1c b4640000 000720c0 00000000 000957fc 00000000 000957ec 00094b28 0000275f
0456340 b4640000 00072190 00094b48 b4640000 000721c4 00000000 0000279f b4640000 000721f8 00094b64 b4640000 0007222c
0456420 00000000 0009587c 00000000 0009586c 00094b70 000027ff b4640000 00072398 00094b90 b4640000 000723cc 00000000
0456500 00094efc 00000000 00094919 00094b9c 00094f2c 00000000 00094f1c 00094bac 00094bcc 00000000 00094f4c 00094bbc
0456560 0000285f b4640000 0007249c 00094bdc b4640000 000724d0 00000000 00094f6c 00000000 00094f5c 00094be8 00094fac
0456640 00000000 00094f9c 00094bf8 00094ffc 00000000 00094934 00094c08 00094c28 00000000 0009507c 00094c18 000028ff
0456720 b4640000 00072670 00094c38 b4640000 000726a4 00000000 00002937 b4640000 0007270c 00094c54 b4640000 00072740
0457000 00000000 00002997 b4640000 000727a8 00094c70 b4640000 000727dc 00000000 000029c7 b4640000 00072844 00094c8c
0457060 b4640000 00072878 00000000 000950ec 00000000 000950dc 00094c98 00002a27 b4640000 00072948 00094cb8 b4640000
0457140 0007297c 00000000 0009524c 00000000 0009528c 00000000 000949a8 00094ccc 00002bf7 b4640000 00072cbc 00094cec
0457220 b4640000 00072cf0 00094cf8 b4640000 00072d24 00000000 00094d14 00000000 000949fc 00094d04 00002c87 b4640000
0457300 00072d8c 00094d24 b4640000 00072dc0 00000000 00002c8f b4640000 00072df4 00094d40 b4640000 00072e28 00000000
0457360 00094d5c 00000000 000953dc 00094d4c 00002cef b4640000 00072e5c 00094d6c b4640000 00072e90 00000000 00002d0f
0457440 b4640000 00072ec4 00094d88 b4640000 00072ef8 00000000 00002d07 b4640000 00072f2c 00094da4 b4640000 00072f60
0457520 00000000 0009573c 00000000 0009572c 00094db0 0009545c 00000000 0009544c 00094dc0 000954bc 00000000 000954ac
0457600 00094dd0 000954dc 00000000 000954cc 00094de0 00094a28 00000000 0009542c 00094df0 0009548c 00000000 0009547c
0457660 00094e00 0009552c 00094a4c 0009557c 00000000 0009556c 00094c18 0009559c 00000000 0009558c 00094e28 00094edc
0457740 00000000 00094ecc 00094e38 0009513c 00000000 0009512c 00094e48 00094d78 00000000 0009540c 00094e59 0009551c
0460020 00000000 0009550c 00094e68 000953cc 00000000 00094e88 00094e78 00000ce7 b4640000 00073474 00094e98 b4640000
0460100 000734a8 00000000 00094fcc 00000000 00094fbc 00094ea4 00094fec 00094c10 00094950 00000000 0009500c 00094ebc
0460160 00000007 b3280000 0007333c 00000000 00001007 b3280000 00070964 00000000 0000000f b3280000 000732d4 00000000
0460240 00002817 b3280000 00072400 00000000 00002827 b3280000 00072434 00000000 00002037 b3280000 0007145c 00000000
0460320 00002837 b3280000 00072468 00000000 0000083f b3280000 00073370 00000000 0000205f b3280000 00071490 00000000
0460400 0000206f b3280000 000714c4 00000000 0000286f b3280000 00072504 00000000 0000288f b3280000 00072538 00000000
0460460 00002897 b3280000 0007256c 00000000 0000209f b3280000 000714f8 00000000 0000289f b3280000 000725a0 00000000
0460540 000008a7 b3280000 00073510 00000000 000028a7 b3280000 000725d4 00000000 000028b7 b3280000 00072608 00000000
0460620 000008bf b3280000 00073578 00000000 000028bf b3280000 0007263c 00000000 000008c7 b3280000 00073648 00000000
0460700 000008cf b3280000 0007367c 00000000 000008d7 b3280000 000735e0 00000000 000008df b3280000 00073614 00000000
0460760 000008e7 b3280000 000735ac 00000000 000008ef b3280000 00073544 00000000 000008f7 b3280000 000734dc 00000000
0461040 000020ff b3280000 000715fc 00000000 00002927 b3280000 000726d8 00000000 00002957 b3280000 00072774 00000000
0461120 000021af b3280000 00071698 00000000 000029bf b3280000 00072810 00000000 000021df b3280000 000716cc 00000000
0461200 000021ef b3280000 00071700 00000000 000029ef b3280000 000728ac 00000000 000029f7 b3280000 000728e0 00000000
0461260 000029ff b3280000 00072914 00000000 00002a37 b3280000 000729b0 00000000 00000a3f b3280000 000733a4 00000000
0461340 00002a3f b3280000 000729e4 00000000 00002a5f b3280000 00070894 00000000 00000a67 b3280000 0007340c 00000000
0461420 0000226f b3280000 00071734 00000000 00002a97 b3280000 00072a18 00000000 000022af b3280000 00071768 00000000
0461500 00001ab7 b3280000 00070a00 00000000 00002abf b3280000 00072a4c 00000000 000022c7 b3280000 0007179c 00000000
0461560 00001acf b3280000 00070a34 00000000 000022df b3280000 000717d0 00000000 00002af7 b3280000 00072a80 00000000
0461640 00002aff b3280000 00072ab4 00000000 00002307 b3280000 000707f8 00000000 0000230f b3280000 00071804 00000000
0461720 00001b17 b3280000 00070a68 00000000 00002317 b3280000 00071838 00000000 00002b17 b3280000 00072ae8 00000000
0462000 00002b1f b3280000 00072b1c 00000000 00002b27 b3280000 00072b50 00000000 00002b2f b3280000 00072b84 00000000
0462060 00002b37 b3280000 00072bb8 00000000 00002b3f b3280000 00072bec 00000000 00002b47 b3280000 00072c20 00000000
0462140 00001b5f b3280000 00070a9c 00000000 00001b97 b3280000 00070c08 00000000 0000239f b3280000 0007193c 00000000
0462220 00001ba7 b3280000 00070c70 00000000 00001baf b3280000 00070c3c 00000000 00002bbf b3280000 00072c54 00000000
0462300 00002bc7 b3280000 00072c98 00000000 00001bef b3280000 00070ca4 00000000 00002407 b3280000 000719d8 00000000
0462360 00002c17 b3280000 000708fc 00000000 00001c1f b3280000 00070cd8 00000000 00002c1f b3280000 000708c8 00000000
0462440 0000242f b3280000 00071a0c 00000000 00002c57 b3280000 00072d58 00000000 00001c67 b4640000 00070d40 000a1068
0462520 00002477 b3280000 00071a40 00000000 00000cdf b3280000 00073308 00000000 000024e7 b3280000 00071adc 00000000
0462600 000024ef b3280000 00071b10 00000000 00001cff b3280000 00070d74 00000000 000024ff b3280000 00071b44 00000000
0462660 00000d0f b3280000 00073318 00000000 00000d17 b3280000 00073064 00000000 00000d27 b3280000 00073134 00000000
0462740 00000d2f b3280000 00073168 00000000 00000d37 b3280000 00072ffc 00000000 00001d37 b3280000 00070e10 00000000
0463020 00000d3f b3280000 00073098 00000000 00000d47 b3280000 0007319c 00000000 00001d47 b3280000 00070e44 00000000
0463100 00000d4f b3280000 00073030 00000000 00000d57 b3280000 000730cc 00000000 00001d57 b3280000 00070e78 00000000

```
0463160   00000d5f b3280000 00073100 00000000 0000255f b3280000 00071d80 00000000 00002567 b3280000 00071be0 00000000
0463240   0000256f b3280000 00071c14 00000000 00000d77 b3280000 00073440 00000000 00002577 b3280000 00071c48 00000000
0463320   00000d7f b3280000 00073204 00000000 00001d7f b3280000 00070eac 00000000 0000257f b3280000 00071c7c 00000000
0463400   00000d87 b3280000 00073238 00000000 00000d8f b3280000 0007326c 00000000 00001d9f b3280000 00070ee0 00000000
0463460   00000d97 b3280000 000732a0 00000000 00002597 b3280000 00071cb0 00000000 00000da7 b3280000 00070d0c 00000000
0463540   00001da7 b3280000 00070f14 00000000 00001db7 b3280000 00070f49 00000000 000025b7 b3280000 00071ce4 00000000
0463620   00001dbf b3280000 00070f7c 00000000 000025bf b3280000 00071d18 00000000 00001dc7 b3280000 00070fb0 00000000
0463700   000025cf b3280000 00071d4c 00000000 00001dd7 b3280000 0007104c 00000000 00001ddf b3280000 00071080 00000000
0463760   00001de7 b3280000 000710b4 00000000 000025e7 b3280000 00071db4 00000000 00001def b3280000 000710e8 00000000
0464040   000025ef b3280000 00071e1c 00000000 000025f7 b3280000 00071de8 00000000 00001e07 b3280000 0007111c 00000000
0464120   00001e0f b3280000 00071150 00000000 00001e1f b3280000 00071184 00000000 00001647 b3280000 00072f94 00000000
0464200   00001e4f b3280000 000711b8 00000000 0000264f b3280000 00071e50 00000000 00001657 b3280000 000731d0 00000000
0464260   0000265f b3280000 00071e84 00000000 00002667 b3280000 00071eb9 00000000 0000166f b3280000 00072fc8 00000000
0464340   00001e6f b3280000 000711ec 00000000 0000267f b3280000 00071eec 00000000 00001ebf b3280000 00071220 00000000
0464420   00001ec7 b3280000 00071254 00000000 000026c7 b3280000 00071f88 00000000 000026cf b3280000 00070860 00000000
0464500   000026d7 b3280000 00071fbc 00000000 00001eef b3280000 00071288 00000000 000026ff b3280000 00071ff0 00000000
0464560   00001f17 b3280000 000712bc 00000000 00002747 b3280000 000720f4 00000000 00001f4f b3280000 000712f0 00000000
0464640   0000274f b3280000 00072128 00000000 00002757 b3280000 0007215c 00000000 00001f77 b3280000 0007082c 00000000
0464720   00001f7f b3280000 00071324 00000000 00001fa7 b3280000 00071359 00000000 000027af b3280000 00072260 00000000
0465000   000027b7 b3280000 00072294 00000000 00001fbf b3280000 0007138c 00000000 000027bf b3280000 000722c8 00000000
0465060   000027c7 b3280000 000722fc 00000000 00001fcf b3280000 000713c0 00000000 000027df b3280000 00072330 00000000
0465140   00000fe7 b3280000 00070930 00000000 000027ef b3280000 00072364 00000000 00000000 55555555 0002188c 00082ef8
0465220   000f4dd4 000f65f0 00000000 0009aaac 00000000 000f04ec 000f47b4 000f4244 000edba8 000eda88 00000000 00000000
0465300   00000000 000f48c8 00000000 0009a044 00000008 0009a04c 00000008 00000000 00000000 00027369 00000000 00066573
0465360   63617065 00000000 00077065 7263656e 74000000 00000000 80000024 00000097 00000003 0000000d 0009a0a8 0009a30c
0465440   0009a3ac 0009a3d8 00000000 80000264 feb84720 ffa82a10 00982920 01880c10 02780b20 03712890 046127a0 05510a90
0465520   064109a0 0730ec90 078d43a0 0910ce90 09adbf20 0af0b090 0be0afa0 0cd9cd10 0dc091a0 0eb9af10 0fa9ae20 10999110
0465600   11899020 12797310 13697220 14595510 15495420 16393710 17293620 18225390 19991820 1a023590 1af234a0 1be21790
0465660   1cd216a0 1dc1f990 1eb1f8a0 1fa1db90 20762b20 2181bd90 22560d20 236ada10 237d4f10 2435ef20 254abc10 2615d120
0465740   272a9e10 27feeda0 290a8010 29decfa0 2aea6210 2afcd710 2bbeb1a0 2cd37e90 2d9e93a0 2eb36090 2f7e75a0 30934290
0466020   31679220 32732490 32859990 33477420 34530690 35275620 3632e890 37073820 381c0510 38e71a20 39fbe710 3a0e5c10
0466100   3ac6fc20 3bdbc910 3cb018a0 3dbbab10 3e8ffaa0 3f9b8d10 406fdca0 4184a990 418de410 424fbea0 43648b90 442fa0a0
0466160   45446d90 460f82a0 47244f90 47f89f20 49043190 4916a630 49d88120 4ae41390 4bb86320 4ccd3010 4d984520 4ead1210
0466240   4f782720 508cf410 509f6910 516143a0 526cd610 53412530 544cb810 552107a0 562c9a10 5700e9a0 5815b690 58282b90
0466320   58e0cba0 59f59890 5ac0ada0 5bd57a90 5ca9ca20 5db55c90 5e89ac20 5f953e90 5fa7b390 60698e20 617e5b10 62497020
0466400   635e3d10 64295220 653e1f10 66126ea0 671e0110 67307610 67f250a0 68fde310 69d232a0 6addc510 6bb214a0 6cc6e190
0466460   6d91f6a0 6ea6c390 6eb73890 6f71d8a0 7086a590 715af520 72668790 733ad720 74466990 751ab920 762f8610 7638c090
0466540   76fa9b20 780f6810 78da7d20 79ef4a10 7aba5f20 7bcf2c10 7ca37ba0 7daf0e10 7dc18310 7e835da0 7f8ef010 00000000
0466620   800000a0 00010001 00010001 00010001 00010001 00010001 00010001 00010001 00010001 00010001 00010002 01000100
0466700   01000100 02010001 00010001 00020100 01000100 01000201 00010001 00010002 01000100 01000100 02010001 00010001
0466760   00020100 01000100 01000201 00010001 00010002 01000100 01000100 02010001 00010001 00020100 01000100 01000201
0467040   00010001 00010002 01000100 00000000 8000002c ffff9d90 00000001 00000000 ffff8f80 00000000 00000004 ffff9d90
0467120   00000001 00000008 00000000 80000018 50445400 50535400 50504554 00000000 00000000 80000038 2f686f6d 652f6f73
0467200   6173322f 622f7175 696e7475 732f6269 6e322e35 2f73756e 342d342e 302f7072 6f6c6f67 00000000 00164564 6163733a
0467260   2f746d70 2f515072 6f6c6f67 32373636 00000000 00102f74 6d702f51 50726f6c 6f673237 36360000 ffffffff 0100092f
0467340   0000001f 00000004 000939e0 0009a4a0 00030000 00000000 00000028 0009a478 b130b66c 00000001 7fffffff 0009a4a1
0467420   02000ce5 0100092d 000030c7 00002aff 0000002c 0009a4a0 b4f0b4e4 00000000 7fffffff 0009a461 00000000 00000001
0467500   0009a478 0002438a 0009a4c4 0009a4c8 000030c7 b3280000 0009a47c 00000000 00152f68 6f6d652f 6f736173 322f622f
0467560   7175696e 74757300 00000028 000f4850 b27cb66c 00000002 7fffffff 000a1600 02000ce5 01002c35 00002c07 00002aff
0467640   0000002c 0009a520 b4f0b4e4 00000001 7fffffff 00080c2d 0000001c 00000005 0009a4f8 0002438a 000f4880 000a1654
0467720   00002c07 b3280000 0009a4fc 00000000 0000002c 0009a848 b27cb66c 00000003 7fffffff 0009a5cc 02000ce5 02001f75
0470000   00002787 000030cf 00002aff 0000002c 0009a58c b4f0b4e4 00000002 7fffffff 0007f2ed 0000001c 00000006 0009a560
0470060   0002438a 0009a800 0009a8d8 00002787 b3280000 0009a564 00000000 0000002c 0009a560 b27cb66c 00000004 7fffffff
0470140   0009a64c 02000ce5 02001f75 0000283f 000006df 00002aff 0000283f b3280000 0009a5d0 00000000 00047132 2e3500f0
0470220   00087375 6e342d34 2e300000 0003322e 35000000 00105375 6e2d342c 2053756e 4f532034 2e300000 00067375 6e342d34
```

```
0470300  00000000 00047375 6e340000 0000002c 0009a5cc b27cb66c 00000005 7fffffff 0009a698 02000ce5 02001f75 00002a17
0470360  000030d7 00002aff 00002a17 b4640000 0009a650 0009a6bc 000022ff b3280000 0009a84c 00000000 0000002c 0009a64c
0470440  b27cb66c 00000006 7fffffff 0009a6d0 02000ce5 02001f75 00002a17 000030ef 00002aff b4640000 0009a69c 0009a6f4
0470520  0000002c 0009a698 b27cb66c 00000007 7fffffff 0009a708 02000ce5 02001f75 00002a17 000030f7 00002aff b4640000
0470600  0009a6d4 0009a72c 0000002c 0009a6d0 b27cb66c 00000008 7fffffff 0009a758 02000ce5 02001f75 00002a17 000006df
0470660  00002aff b4640000 0009a70c 00000000 00146765 6e657269 632f7132 2e352f68 656c7071 79730000 00000030 0009a708
0470740  b27cb66c 00000009 7fffffff 0009a7c8 02000ce5 02001f75 00002127 01002785 00003107 00002aff 00002127 b3280000
0471020  0009a75c 00000000 0009a7f0 0009a798 0009a5f0 00000000 00087170 6c696232 2e350000 00106765 6e657269 632f7170
0471100  6c696232 2e350000 00000030 0009a758 b27cb66c 0000000a 7fffffff 0009a848 02000ce5 02001f75 0000277f 01002785
0471160  00003117 00002aff 0000277f b3280000 0009a7cc 00000000 0009a5b4 00000000 0009a670 00000000 0009a780 00000000
0471240  00000000 0009a879 ffffffff 01002307 00002c07 00000004 000939e0 0009a8b4 00030000 00000000 00000038 0009a7c8
0471320  b27cb66c 0000000b 7fffffff 0009a58d 02000ce5 02001f75 000022ff 0000000c 02000935 004d4183 01002305 0000000e
0471400  0009a680 0009a790 0000002c 0009a8f0 b27cb66c 0000000c 7fffffff 0009a8f0 02000ce5 01002305 0100277d 000022ff
0471460  00002aff 0000002c 0009a8b4 b4f0b4e4 0000000b 7fffffff 0009a831 00000000 00000001 0009a888 0002438a 0009a5b0
0471540  0100277f b4640000 0009a88c 0009a914 0000002c 0009a888 b27cb66c 0000000d 7fffffff 0009a8b5 02000ce5 01002305
0471620  0100277d 00002aaf 00002aff b4640000 0009a8f4 00000000 ffffffff 00002887 0000001f 00000000 000939e0 0009a948
0471700  00030000 00000000 00000024 0009a948 b0f8b66c 0000000e 7fffffff 0009a931 02000ce5 00002887 00002aff 00122f68
0471760  6f6d652f 6f736173 312f612f 73726565 00000000 001d2f68 6f6d652f 6f736173 312f612f 73726565 2f70726f 6c6f672e
0472040  696e6900 00000028 0009a9a4 b130b66c 0000000f 7fffffff 0009a9cd 02000ce5 01002b4d 00002c07 00002aff 0000002c
0472120  0009a9cc b4f0b4e4 0000000e 7fffffff 00080b0d 00000000 00000001 0009a9a4 0002438a 0009a9f0 0009a9f4 00002c07
0472200  b3280000 0009a9a8 00000000 002a2f68 6f6d652f 6f736173 312f612f 73726565 2f73656d 616e7469 635f6368 65636b31
0472260  2f6d6169 6e2e706c 00000000 00132f74 61702f51 50726f6c 6f673237 36362e70 6c000000 00272f68 6f6d652f 6f736173
0472340  312f612f 73726565 2f73656d 616e7469 635f6368 65636b31 2f6c6976 65006463 002c2f68 6f6d652f 6f736173 322f622f
0472420  7175696e 7475732f 62696e32 2e352f73 756e342d 342e302f 70726f6c 6f670028 0009caec 00001fac 6e73292e 0a3a2d20
0472500  636f6d70 696c6528 61757866 6e73292e 0a3a2d20 636f6d70 696c6528 7061636b 61676529 2e0a3a2d 20636f6d 70696c65
0472560  28617263 68292e0a 3a2d2063 6f6d7069 6c652864 65736967 6e66696c 65292e0a 3a2d2063 6f6d7069 6c652865 6e746974
0472640  795f6465 636c292e 0a3a2d20 636f6d70 696c6528 65787072 292e0a3a 2d20636f 6d70696c 65287369 6d706c65 65787072
0472720  292e0a3a 2d20636f 6d70696c 65287374 61747329 2e0a3a2d 20636f6d 70696c65 28636f6e 63757272 656e7429 2e0a3a2d
0473000  20636f6d 70696c65 28747970 65292e0a 3a2d2063 6f6d7069 6c652873 75627072 6f676361 6c6c7329 2e0a3a2d 20636f6d
0473060  70696c65 28636f6d 706f6e65 6e74292e 0a3a2d20 636f6d70 696c6528 61747472 69627574 6573292e 0a3a2d20 636f6d70
0473140  696c6528 7465726d 696e616c 73292e0a 3a2d2063 6f6d7069 6c652874 7970655f 73656d61 6e746963 73292e0a 3a2d2063
0473220  6f6d7069 6c652827 68696572 2f686965 7266756e 63732729 2e0a0a3a 2d20636f 6d70696c 65287265 73657429 2e0a3a2d
0473300  20636f6d 70696c65 28657272 6d736729 2e0a0a0a 7379656e 61785f63 6865636b 2846696c 65312920 3a2d2020 20636f6e
0473360  6361745f 6e616d65 73285b46 696c6531 2c766864 6c5d2c27 2e272c46 696c6529 2c0a0909 09737461 74697374 69637328
0473440  72756e74 696d652c 5f292c20 76706172 73652846 696c652c 5b487c54 5d292c20 73746174 69737469 63732872 756e7469
0473520  6d652c5b 5f2c5469 6d65315d 292c200a 09090966 6f726d61 74282754 6f6b656e 697a696e 6720746f 6f6b207e 33642073
0473600  65632e7e 6e272c20 5b546963 65315d29 2c20212c 200a0909 09737461 74697374 69637328 72756e74 696d652c 5f292c20
0473660  72657472 61637428 616e616c 797a696e 675f6669 6c65285f 29292c20 61737365 72742861 6e616c79 7a696e67 5f66696c
0473740  65284669 6c652929 2c0a0909 09287668 646c5f64 65736967 6e285f2c 5b487c54 5d2c5b5d 292c2073 74617469 73746963
0474020  73287275 6e74696d 652c5b5f 2c54696d 65325d29 2c200a09 09090966 6f726d61 74282753 796e7461 78696e67 20746f6f
0474100  6b207e33 64207365 632e7e6e 272c205b 54696d65 325d292c 0a090909 09726574 72616374 616c6c28 70617273 6564285f
0474160  2c5f2929 3b206661 74616c5f 6572726f 7228482c 46696c65 29292e0a 0a0a7668 646c2846 696c6531 29203a2d 09636f6e
0474240  6361745f 6e616d65 73285b46 696c6531 2c766864 6c5d2c27 2e272c20 46696c65 292c200a 09097374 61746973 74696373
0474320  2872756e 74696d65 2c5f292c 20767061 72736528 46696c65 2c5b487c 545d292c 20737461 74697374 69637328 72756e74
0474400  696d652c 5b5f2c54 696d6531 5d282c0a 0909666f 726d6174 2827546f 6b656e69 7a696e67 20746f6f 6b207e33 64207365
0474460  632e7e6e 272c205b 54696d65 315d292c 20212c20 0a090973 74617469 73746963 73287275 6e74696d 652c5f29 2c202072
0474540  65747261 63742861 6e616c79 7a696e67 5f66696c 65285f29 292c2061 73736572 7428616e 616c797a 696e675f 66696c65
0474620  2846696c 6529292c 200a0909 28766864 6c5f6465 7369676e 28532c5b 487c545d 2c5b5d29 2c207374 61746973 74696373
0474700  2872756e 74696d65 2c5b5f2c 54696d65 325d292c 200a0909 09666f72 6d617428 2753796e 74617869 6e672074 6f6f6b20
0474760  7e336420 7365632e 7e6e272c 205b5469 6d65325d 292c2072 65747261 6374616c 6c287061 72736564 285f2c5f 29293b0a
0475040  09090966 6174616c 5f657272 6f722848 2c46696c 6529292c 0a090973 74617469 73746963 73287275 6e74696d 652c5f29
0475120  2c205323 63686563 6b5f7365 6d616e74 6963732c 200a0909 616e616c 797a696e 675f756e 69745f6e 756d2855 6e292c20
0475200  72657472 61637428 616e616c 5f756e69 74285f29 292c2055 6e312069 7320556e 2d312c0a 09096173 73657274 28616e61
0475260  6c5f756e 69742855 6e312929 2c0a0909 73746174 69737469 63732872 756e7469 6d652c5b 5f2c5469 6d65335d 292c2066
0475340  6f726d61 74282753 656d616e 74697869 6e672074 6f6f6b20 7e336420 7365632e 7e6e272c 205b5469 6d65335d 292e200a
```

```
0475420  0a3a2d20 7668646c 28737464 7061636b 67292e0a 0a000000 00000000 00000000 00000000 00000000 00000000 00000000
0475500  00000000 00000000 00000000 00000000 00000000 00000000 00000000 00000000 00000000 00000000 00000000 00000000
*
0504520  00000000 000006df 0000022b 0009beda 0000036b 0009bee2 0000030b 0009beea 0000031b 0009bef2 0000039b 0009befa
0504600  000001d3 0009bf02 0000017b 0009bf0a 000003a3 0009bf12 0000036b 0009bf1a 00000383 0009bf22 0000017b 0009bf2a
0504660  0000028b 0009bf32 00000283 0009bf3a 00000393 0009bf42 0000037b 0009bf4a 00000363 0009bf52 0000037b 0009bf5a
0504740  0000033b 0009bf62 00000193 0009bf6a 000001bb 0009bf72 000001b3 0009bf7a 000001b3 00000007 000001d3 00000007
0505020  0000039b 0009bf82 0000031b 0009bf8a 0000030b 0009bf92 0000036b 0009bf9a 0000022b 0009bfa2 0100092f 000030c7
0505100  0000000b 0000092f 02000a57 0000001f 00000007 02000ce7 0009bfb1 00002aff 004d2503 0009bfe5 0009bfee 01002a27
0505160  0000002b 00000fff 0009bff6 0000001f 0009bffe 0009c005 00000007 01002a27 00000083 01002a27 00000033 01002a27
0505240  0000007b 03002427 0009bfde 0009c00d 0009c015 0009c015 00000007 0009c00d 0009c02e 0009bfde 0009c036 00001dff
0505120  0009c03e 02001f77 00002787 000030cf 00000013 00001f77 01002c37 00002c07 02000a57 0000004f 00000007 02000ce7
0505400  0009c061 00002aff 004d2903 02000a57 00002c07 00000007 02000ce7 0009c04d 00002aff 004d2c63 02001f77 0000283f
0505460  000006df 02000a57 00002c07 00000007 02000ce7 0009c0a1 00002aff 004d2c63 01001eaf 004d2c63 0000039b 0009c0da
0505540  000003ab 0009c0e2 00000373 0009c0ea 000001a3 0009c0f2 0000016b 0009c0fa 000001a3 0009c102 00000173 0009c10a
0505620  00000183 00000007 00002bbf 000030e7 00004e73 00000193 0009c126 00000173 0009c12e 000001ab 00000007 000030ef
0505700  0009c176 00000173 0009c10a 0000039b 0009c14e 000003ab 0009c156 00000373 0009c15e 000001a3 0009c166 0000016b
0505760  0009c16e 000001a3 00000007 000030f7 0009c1a6 0000016b 0009c16e 0000039b 0009c18e 000003ab 0009c196 00000373
0506040  0009c19e 000001a3 00000007 000006df 00000007 000030d7 0009c136 02001f77 00002a17 000030d7 02000a57 00002c07
0506120  00000007 02000ce7 0009c1b5 00002aff 004d2c63 01001eaf 004d2c63 02001f77 00002a17 000030ef 02000a57 00002c07
0506200  00000007 02000ce7 0009c1e5 00002aff 004d2c63 01001eaf 004d2c63 02001f77 00002a17 000030f7 02000a57 00002c07
0506260  00000007 02000ce7 0009c215 00002aff 004d2c63 01001eaf 004d2c63 02001f77 00002a17 000006df 02000a57 00002c07
0506340  00000007 02000ce7 0009c245 00002aff 004d2c63 01001eaf 004d2c63 0000038b 00000007 0000038b 0009c11e 00002127
0506420  00000007 000030ff 0009c286 0000038b 0009c29e 00000193 0009c2a6 00000173 0009c2ae 000001ab 00000007 0000017b
0506500  0009c296 0000017b 0009c2c6 0000038b 0009c2ce 00000193 0009c2d6 00000173 0009c2de 000001ab 0009c326 00000343
0506560  0009c2ee 0000032b 0009c2f6 00000363 0009c2fe 00000383 0009c306 0000039b 0009c30e 000003cb 0009c316 0000039b
0506640  00000007 0000017b 0009c2e6 0000017b 0009c32e 00000343 0009c336 0000032b 0009c33e 00000363 0009c346 00000383
0506720  0009c34e 0000039b 0009c356 000003cb 0009c35e 0000039b 00000007 0000033b 0009c36e 0000032b 0009c376 00000373
0507000  0009c37e 0000032b 0009c386 00000393 0009c38e 0000034b 0009c396 0000031b 00000007 0000033b 0009c3a6 0000032b
0507060  0009c3ae 00000373 0009c3b6 0000032b 0009c3be 00000393 0009c3c6 0000034b 0009c3ce 0000031b 0009c2be 01002787
0507140  00003107 02001f77 00002127 0009c3d5 02000a57 00002c07 00000007 02000ce7 0009c3dd 00002aff 004d2c63 01001eaf
0507220  004d2c63 00000313 00000007 0000034b 0009c40e 00000363 0009c416 00000383 0009c41e 0000038b 0009c426 0000038b
0507300  0009c43e 00000383 0009c446 00000363 0009c44e 0000034b 0009c456 00000313 0009c11e 0000310f 00000007 0000038b
0507360  0009c46e 00000383 0009c476 00000363 0009c47e 0000034b 0009c486 00000313 0009c48e 00000193 0009c496 00000173
0507440  0009c49e 000001ab 00000007 0000017b 0009c466 0000017b 0009c4b6 0000038b 0009c4be 00000383 0009c4c6 00000363
0507520  0009c4ce 0000034b 0009c4d6 00000313 0009c4de 00000193 0009c4e6 00000173 0009c4ee 000001ab 00000007 0000033b
0507600  0009c4fe 0000032b 0009c506 00000373 0009c50e 0000032b 0009c516 00000393 0009c51e 0000034b 0009c526 0000031b
0507660  00000007 0000033b 0009c536 0000032b 0009c53e 00000373 0009c546 0000032b 0009c54e 00000393 0009c556 0000034b
0507740  0009c55e 0000031b 0009c4ae 01002787 00003117 02001f77 0000277f 0009c565 02000a57 00002c07 00000007 02000ce7
0510020  0009c56d 00002aff 004d2c63 01001eaf 004d2c63 02001f77 000022ff 0009c5a4 01002307 0009c5a4 02000ce7 0009c59d
0510100  0009c5a9 02000a57 00002c07 00000007 02000937 004d4183 0009c5a9 02000ce7 0009c59d 0009c5c9 004d2c63 01001eaf
0510160  004d2c63 0100277f 000022ff 01002307 0009c5ed 0000000b 00002307 01002c37 00002c07 02000ce7 0009c605 00002aff
0510240  02000ce7 0009c625 00002aff 01002c37 00002c07 02000a57 00002c07 00000007 02000ce7 0009c5f5 00002aff 004d45a3
0510320  0100277f 00002aaf 01002307 0009c649 02000a57 00002c07 00000007 02000ce7 0009c651 00002aff 004d45a3 01001eaf
0510400  004d45a3 00000003 00002887 02000a57 0000001f 00000007 02000ce7 00002887 00002aff 00000003 0009c6a9 0009c6b2
0510460  01002a27 0000002b 00000fff 0009c6ba 0000001f 0009c6c2 0009c6c9 00000007 01002a27 00000083 01002a27 00000033
0510540  01002a27 0000007b 03002427 0009c6a2 0009c6d1 0009c6d9 0009c6d9 00000007 0009c6d1 0009c6f2 0009c6a2 0009c6fa
0510620  00001dff 0009c702 01002b4f 0009c714 01002b4f 00002c07 02000a57 0000004f 00000007 02000ce7 0009c719 00002aff
0510700  004d4e63 01002b4f 00002c07 02000ce7 0009c73d 00002aff 02000ce7 0009c75d 00002aff 01002b4f 00002c07 01002a27
0510760  000000cb 01002a27 00000033 01002a27 0000007b 03002427 0009c765 0009c76d 0009c775 0009c775 00000007 0009c76d
0511040  0009c78e 0009c765 0009c796 00001dff 0009c79e 0009c7ac 000000eb 0009c7b9 10002c4f 0009c7bc 0009c7c0 0009c7c4
0511120  0009c7c8 0009c7cc 0009c7d0 0009c7d4 0009c7d8 0009c7dc 0009c7e0 0009c7e4 0009c7e8 0009c7ec 0009c7f0 0009c7f4
0511200  0009c7f8 01001b97 00000927 00000123 0009c80e 0000032b 0009c816 00000323 0009c81e 0000034b 0009c826 000003a3
0511260  0009c82e 0000037b 0009c836 00000393 0009c83e 000002fb 0009c846 00000363 0009c84e 0000037b 0009c856 0000030b
0511340  0009c85e 00000323 0009c866 000002fb 0009c86e 0000031b 0009c876 0000037b 0009c87e 00000323 0009c886 0000032b
```

```
0511420  00000007 0009c7fd 0009c896 0000098f 0009c8de 01001b97 00001d7f 0000031b 0009c8ae 0000037b 0009c8b6 00000373
0511500  0009c8be 0000039b 0009c8c6 000003ab 0009c8ce 00000363 0009c8d6 000003a3 00000007 0009c89d 0009c8e6 00000a3f
0511560  0009ca46 01001b97 0000312f 0000017b 0009c8fe 00000343 0009c906 0000037b 0009c90e 0000036b 0009c916 0000032b
0511640  0009c91e 0000017b 0009c926 0000037b 0009c92e 0000039b 0009c936 0000030b 0009c93e 0000039b 0009c946 0000018b
0511720  0009c94e 0000017b 0009c956 0000030b 0009c95e 0000017b 0009c966 0000039b 0009c96e 00000393 0009c976 0000032b
0512000  0009c97e 0000032b 0009c986 0000017b 0009c98e 0000039b 0009c996 0000032b 0009c99e 0000036b 0009c9a6 0000030b
0512060  0009c9ae 00000373 0009c9b6 000003a3 0009c9be 0000034b 0009c9c6 0000031b 0009c9ce 000002fb 0009c9d6 0000031b
0512140  0009c9de 00000343 0009c9e6 0000032b 0009c9ee 0000031b 0009c9f6 0000035b 0009c9fe 0000018b 0009ca06 0000017b
0512220  0009ca0e 0000036b 0009ca16 0000030b 0009ca1e 0000034b 0009ca26 00000373 0009ca2e 00000171 0009ca36 00000383
0512300  0009ca3e 00000363 00000007 0009c8ed 0009ca4e 000009ff 00000007 0000002c 0009ec74 b27cb66c 00000010 7fffffff
0512360  0009ca89 02000ce5 0200293d 0000312f 000001db 00002aff 0000002c 0009ca88 b4f0b4e4 0000000f 7fffffff 000806cd
0512440  000000fc 00000024 000edb54 0002438a 000e6d68 0009ef44 0000312f b3282b4f 0009ca60 00000000 00222f68 6f6d652f
0512520  6f736173 312f612f 73726565 2f73656d 616e7469 635f6368 65636b31 00000323 0009cbbc 0000006c b130b66c 00000011
0512600  00000757 0009cb31 02000ce5 0500236d 00001d7f 00001e87 000001db 0200095d 00000013 0000001b 0000313f 00002aff
0512660  0009cb5c 0000002c b4f0b4e4 00000010 7fffffff 0007fa2d 00000000 00000000 0009caf0 0002438a 000efb18 000a1b40
0512740  00000000 00000010 0009caf4 00000000 001f7e2f 70726f6c 6f672d74 7269616c 732f6463 74672f64 63746731 2f6d6169
0513020  6e00017b 0000002c 000a0e88 b27cb66c 00000759 7fffffff 000edb80 02000ce5 02001f6d 0000312f 00002c07 00002aff
0513100  0009d1b4 0000002c b4f0b4e4 00000011 7fffffff 0007fa8d 00000000 00000000 0009cb94 0002438a 000eda98 000bdc94
0513160  0000312f b328cbf2 0009cb98 00000000 00302f68 6f6d652f 6f736173 312f612f 73726565 2f70726f 6c6f672d 74726961
0513240  6c732f64 6374672f 64637467 312f6d61 696e0073 00332f68 6f6d652f 6f736173 312f612f 73726565 2f70726f 6c6f672d
0513320  74726961 6c732f64 6374672f 64637467 312f6d61 696e2e70 6c000383 0000002c 0009ce54 b27cb66c 00000132 7fffffff
0513400  000b2d3c 02000ce5 0200293d 0000385f 00000243 00002aff 002a2f68 6f6d652f 6f736173 312f612f 73726565 2f73656d
0513460  616e7469 635f6368 65636b31 2f6c6578 2f746f70 002d2063 002d2f69 6f6d652f 6f736173 312f612f 73726565 2f73656d
0513540  616e7469 635f6368 65636b31 2f6c6578 2f746f70 2e706c00 0000002c 0009ce28 b27cb66c 000000a6 7fffffff 000acbdc
0513620  02000ce5 0200293d 0000331f 0000022b 00002aff 00262f68 6f6d652f 6f736173 312f612f 73726565 2f73656d 616e7469
0513700  635f6368 65636b31 2f6c6578 002c5b5d 0000002c 000b0d04 b27cb66c 000001de 7fffffff 000aabd4 02000ce5 02001f6d
0513760  0000331f 00002c07 00002aff 000e7363 69656475 6c655f65 76656e74 00000000 0000002c 000aebcc b27cb66c 000003fa
0514040  7fffffff 000d2b5c 02000ce5 0200293d 000042d7 0000029b 00002aff 002f2f68 6f6d652f 6f736173 312f612f 73726565
0514120  2f73656d 616e7469 635f6368 65636b31 2f6c6578 2f726573 65727665 64005b5d 00322f68 6f6d652f 6f736173 312f612f
0514200  73726565 2f73656d 616e7469 635f6368 65636b31 2f6c6578 2f726573 65727665 642e706c 000a0909 0000002c 000b2d3c
0514260  b27cb66c 000000aa 7fffffff 0009ccf8 02000ce5 0200293d 00003357 00000233 00002aff 0000002c 000bb68c b27cb66c
0514340  00000136 7fffffff 0009cc6c 02000ce5 0200293d 0000387f 0000024b 00002aff 0000002c 000b2d94 b27cb66c 000000b1
0514420  7fffffff 0009ece8 02000ce5 02001f6d 00003357 00002c07 00002aff 000e6367 72617068 69635f63 68617273 00000000
0514500  28c40024 0009d230 36903574 56f86c08 6bc84538 6c085370 56f84af8 000003eb 53707220 000b899c 0009cf40 28c40024
0514560  0009ceb8 36903574 56f86c08 6bc84538 6c085370 56f84af8 000003db 53707220 0000392f b3280010 0009dc54 00000000
0514640  00000000 28c40024 0009cee4 36903574 56f86c08 6bc84538 6c085370 56f84af8 00000303 53707220 000a0f90 00000000
0514720  27f0002e 0009cf78 4e1c0000 0000335f 517c0000 03003367 4b8c0000 0000335f 4b8c0000 00000963 671c4950 228c0000
0515000  28c4002e 0009cfa8 4e1c0000 0000336f 517c0000 03003377 4b8c0000 0000336f 4b8c0000 00001903 671c4950 228c0000
0515060  28c4002e 0009cfd8 4e1c0000 0000337f 517c0000 03003377 4b8c0000 0000337f 4b8c0000 00001903 671c4950 228c0000
0515140  28c4002e 0009d008 4e1c0000 0000246f 517c0000 03003387 4b8c0000 0000246f 4b8c0000 00000c83 671c4950 228c0000
0515220  28c4002e 00094038 4e1c0000 0000338f 517c0000 03003377 4b8c0000 0000338f 4b8c0000 00001903 671c4950 228c0000
0515300  28c4002e 0009d068 4e1c0000 00003397 517c0000 03003377 4b8c0000 00003397 4b8c0000 00001903 671c4950 228c0000
0515360  28c4002e 00094098 4e1c0000 000025c7 517c0000 03003367 4b8c0000 000025c7 4b8c0000 00000963 671c4950 228c0000
0515440  28c4002e 0009d0c8 4e1c0000 0000339f 517c0000 03003387 4b8c0000 0000339f 4b8c0000 00000c83 671c4950 228c0000
0515520  2954002e 0002438a 4e1c0000 000033a7 517c0000 03003377 4b8c0000 000033a7 4b8c0000 00001903 671c4950 228c0000
0515600  00000000 0009d014 0009d044 00090a4 0009d0d4 00000000 00000000 00000000 0009d074 00000000 00000000 0009cf54
0515660  00000000 000b4d4d 00000000 0009cfb4 28c40024 0009cf1c 36903574 56f86c08 6bc84538 6c085370 56f84af8 000002f3
0515740  53707220 2c780014 0002438a 56f84af8 fffffffb 6b887220 0000002c 000aabd4 b27cb66c 000001c4 7fffffff 000bb710
0516020  02000ce5 02001f6d 0000385f 00002c07 00002aff 000f2066 6f756e64 20696e20 6c696e65 20000000 0009d258 0000002c
0516100  b27cb66c 00000134 000001c3 0009cbc1 02000ce5 02002385 0000385f 00002c07 00002aff 00352f68 6f6d652f 6f736173
0516160  322f622f 7175696e 7475732f 67656e65 7269632f 71706c69 62322e35 2f6c6962 72617279 2f637479 70657300 2c78001a
0516240  0002438a a858aab4 0020a354 a858aab4 0009a260 228c4f45 29540024 0002438a 36903574 56f86c08 6bc84538 6c085370
0516320  56f84af8 000003f3 53707220 0009d534 0000002c b288b66c 00000135 7fffffff 0009ce54 02000ce5 0100147d 01002d65
0516400  0000000b 00002aff 00036973 5f616c6e 756d00ff 2cacd534 0002438a 2ca05378 00000000 00000000 0009d15c 0009d15c
0516460  0009d166 0009cf18 00382f68 6f6d652f 6f736173 322f622f 7175696e 7475732f 67656e65 7269632f 71706c69 62322e35
```

```
0516540  2f6c6962 72617279 2f637479 7065732e 706c0024 00086973 5f617363 69690000 2c780026 0002438a 45b83574 45506b48
0516620  5370329c 24d00000 0007fccc 0014aa34 aa18a354 22a04ec8 0000360f b3280010 0009dc20 00000000 000b4f64 000b4f78
0516700  000b4fb0 000b4fd0 000b4fec 000b5008 000b5024 000b5044 000b5098 000b50b8 000b50d8 000b511c 000b5170 000b51cc
0516760  000b51e0 000b51f4 000b5208 000b5230 000b5244 000b52a4 000b52c0 000b52f1 000b530c 000b533c 000b535c 000b5378
0517040  000b5398 000b53b8 000b53d8 000b5408 000b5438 000b5458 000b5480 000b54a0 000b54bc 000b54e9 000b5508 000b5524
0517120  000b5540 000b5554 000b5568 000b5411 000b559c 000b55b0 000b55c4 000b55d9 000b4f8c 00000000 00000000 00000000
0517200  000b5154 00000000 00000000 00000000 00000000 00000000 00000000 00000000 00000000 00000000 00000000 00000000
0517260  00000000 00000000 00000000 00000000 00000000 00000000 00000000 000b5258 00000000 00000000 00000000 00000000
0517340  00000000 000b5274 00000000 000b5184 00000000 00000000 00000000 00000000 00000000 00000000 00000000 00000000
0517420  000b5198 00000000 00000000 00000000 00000000 00000000 000b5058 000acc64 00000000 000b4f3d 00000000 00000000
0517500  00000000 00000000 00000000 00000000 00000000 00000000 00000000 00000000 00000000 00000000 000b507c 00000000
0517560  000b4e68 00000000 00000000 00000000 00000000 00000000 00000000 0009ed18 000aaa80 000b4e10 000b4e54 000b4e98
0517640  000b4eb4 000b4ec8 000b4edc 000b4efc 000b4f10 000b4f34 0009dcc0 0000002c b288b66c 00000135 7fffffff 0009d25c
0517720  02000ce5 0100147d 01002d65 0000000b 00002aff 2aa8a470 000ca454 000c7214 2c7800d6 0002438a 45c43574 3310247c
0520000  000b7a9c 00182e7c adec2ba0 00180022 3788ac70 0000005b aa502e98 45386d0c 537056f8 4b8c0000 0000030b 5370723c
0520060  2c300018 37884c70 00000063 aa502e98 aa18aab4 0063a354 723c2c30 001a3788 4e1c0000 0000006b aa502e98 aa18aab4
0520140  0064a354 723c2c30 001a3789 4e1c0000 00000073 aa502e98 aa18aab4 0065a354 723c2c30 001a3788 4e1c0000 0000007b
0520220  aa502e98 aa18aab4 0066a354 723c2c58 2e7cac08 2ba00014 001a37f0 4e700000 00000083 a8582e98 aa18aab4 0067a354
0520300  723c2c58 c5a80000 00000034 0009d888 b27cb66c 00000143 7fffffff 0009d8dc 02000ce5 04002105 00003627 00000013
0520360  00003867 00001ef7 00002aff 000a688c 00000000 0000002c 000bb710 b27cb66c 00000178 7fffffff 000b2d94 02000ce5
0520440  02001f6d 0000387f 00003867 00002aff 2c780012 0002438a 4e1c0000 00003997 228c0000 0000002c 000a2578 b27cb66c
0520520  00000179 7fffffff 000bb750 02000ce5 0200218d 00002c07 00003867 00002aff 0000002c 000a0f40 b27cb66c 0000013a
0520600  7fffffff 000bb77c 02000ce5 020024a5 00003867 0000347f 00002aff 00000034 000a127c b27cb66c 0000013b 7fffffff
0520660  0009d750 02000ce5 04002105 00003887 0000000b 00003867 00001ef7 00002aff 00000034 0009471c b27cb66c 0000013c
0520740  7fffffff 0009d784 02000ce5 04002105 0000361f 0000000b 00003867 00001ef7 00002aff 00000034 0009d750 b27cb66c
0521020  0000013d 7fffffff 0009d7b8 02000ce5 04002105 0000388f 0000000b 00003867 00001ef7 00002aff 00000034 0009d784
0521100  b27cb66c 0000013e 7fffffff 0009d7ec 02000ce5 04002105 00003897 0000000b 00003867 00001ef7 00002aff 00000034
0521160  0009d7b8 b27cb66c 0000013f 7fffffff 0009d820 02000ce5 04002105 0000389f 0000000b 00003867 00001ef7 00002aff
0521240  00000034 0009d7ec b27cb66c 00000140 7fffffff 0009d854 02000ce5 04002105 000038a7 0000000b 00003867 00001ef7
0521320  00002aff 00000034 0009d820 b27cb66c 00000141 7fffffff 0009d888 02000ce5 04002105 000038af 0000000b 00003867
0521400  00001ef7 00002aff 00000034 0009d854 b27cb66c 00000142 7fffffff 0009d648 02000ce5 04002105 00003627 0000000b
0521460  00003867 00001ef7 00002aff 2c780012 0002438a 4e1c0000 00003937 228cd8c8 00066c65 782e706c 00000000 00000034
0521540  0009d648 b27cb66c 00000144 7fffffff 0009d910 02000ce5 04002105 00003627 0000001b 00003867 00001ef7 00002aff
0521620  00000034 0009d8dc b27cb66c 00000145 7fffffff 0009d944 02000ce5 04002105 000038b7 0000000b 00003867 00001ef7
0521700  00002aff 00000034 0009d910 b27cb66c 00000146 7fffffff 0009d978 02000ce5 04002105 000038bf 0000000b 00003867
0521760  00001ef7 00002aff 00000034 0009d944 b27cb66c 00000147 7fffffff 0009d9ac 02000ce5 04002105 000038c7 0000000b
0522040  00003867 00001ef7 00002aff 00000034 0009d978 b27cb66c 00000148 7fffffff 0009d9e0 02000ce5 04002105 000038cf
0522120  0000000b 00003867 00001ef7 00002aff 00000034 0009d9ac b27cb66c 00000149 7fffffff 0009da14 02000ce5 04002105
0522200  000038d7 0000000b 00003867 00001ef7 00002aff 00000034 0009d9e0 b27cb66c 0000014a 7fffffff 0009da48 02000ce5
0522260  04002105 000038df 0000000b 00003867 00001ef7 00002aff 00000034 0009da14 b27cb66c 0000014b 7fffffff 0009da7c
0522340  02000ce5 04002105 000038e7 0000000b 00003867 00001ef7 00002aff 00000034 0009da48 b27cb66c 0000014c 7fffffff
0522420  0009dab0 02000ce5 04002105 000038ef 00000013 00003867 00001ef7 00002aff 00000034 0009da7c b27cb66c 0000014d
0522500  7fffffff 0009dae4 02000ce5 04002105 000038f7 0000000b 00003867 00001ef7 00002aff 00000034 0009dab0 b27cb66c
0522560  0000014e 7fffffff 0009db19 02000ce5 04002105 000038ff 0000000b 00003867 00001ef7 00002aff 00000034 0009dae4
0522640  b27cb66c 0000014f 7fffffff 0009db4c 02000ce5 04002105 00003907 0000000b 00003867 00001ef7 00002aff 00000034
0522720  0009db18 b27cb66c 00000150 7fffffff 0009db80 02000ce5 04002105 0000390f 0000000b 00003867 00001ef7 00002aff
0523000  00000034 0009db4c b27cb66c 00000151 7fffffff 0009dbb4 02000ce5 04002105 00003917 0000000b 00003867 00001ef7
0523060  00002aff 00000034 0009db80 b27cb66c 00000152 7fffffff 0009dbe8 02000ce5 04002105 0000391f 0000000b 00003867
0523140  00001ef7 00002aff 00000034 0009dbb4 b27cb66c 00000153 7fffffff 0009dc1c 02000ce5 04002105 00003927 0000000b
0523220  00003867 00001ef7 00002aff 00000034 0009dbe8 b27cb66c 00000154 7fffffff 0009dc50 02000ce5 04002105 0000360f
0523300  00000013 00003867 00001ef7 00002aff 00000034 0009dc1c b27cb66c 00000155 7fffffff 000bb7a8 02000ce5 04002105
0523360  0000392f 00000013 00003867 00001ef7 00002aff 0000002c 000aebf8 b27cb66c 00000430 7fffffff 000d2b88 02000ce5
0523440  02001f6d 000042d7 00002c07 00002aff 000e6d6f 72655f73 65715f73 746d7473 00000000 0009de2c 00000090 b27cb66c
0523520  000003fc 0000042f 0009cbc1 02000ce5 02002385 000042d7 00002c07 00002aff 0009dd24 00000038 b27cb66c 000003fd
0523600  00000431 0009de30 02000ce5 05001b0d 000042df 0000000b 00002c07 0067f4c3 0000029b 00002aff 0009de2c 0000002c
```

| | | | | | | | | | | | | |
|---|---|---|---|---|---|---|---|---|---|---|---|---|
| 0523660 | b4f0b4e4 | 000003fc | 7fffffff | 0007eaad | 00000000 | 00000000 | 000a2a3c | 0002438a | 00048124 | 2c780038 | 0002438a | 35c82520 |
| 0523740 | 417c329c | 24d00000 | 000d7538 | 001443e4 | 01003ff7 | 69b04078 | 000b0b9c | 001039a4 | 00080d0c | 000c234c | 0007fd0c | 000000a4 |
| 0524020 | 000d43b0 | b27cb66c | 000003fe | 7fffffff | 0009e0f0 | 02000ce5 | 020031ed | 020031e5 | 00003b27 | 02000a3d | 030036bd | 000036ef |
| 0524100 | 0000000c | 00000010 | 02000a3d | 02000885 | 00002a4f | 00000014 | 02000885 | 000042e7 | 00000018 | 020031f5 | 02003ff5 | 0000001c |
| 0524160 | 02003b25 | 010036ed | 00000020 | 00000024 | 02000a3d | 02000885 | 00000016 | 02003ff5 | 0000001e | 00000022 | 02000885 | 0000001a |
| 0524240 | 02003ff5 | 0000001e | 00000026 | 00002aff | 0009dee4 | 00000038 | b27cb66c | 000003ff | 00000432 | 0009e6b4 | 02000ce5 | 05001b0d |
| 0524320 | 00003b27 | 0000001b | 00002c07 | 006ba9c3 | 0000029b | 00002aff | 00000064 | 000a6760 | b27cb66c | 00000495 | 7fffffff | 000a8abc |
| 0524400 | 02000ce5 | 020031ed | 020031e5 | 00004467 | 02000885 | 00004427 | 0000000c | 020031f5 | 02003ebd | 00000010 | 00000001 | 00000014 |
| 0524460 | 00000007 | 02000885 | 0000000e | 02004005 | 00000012 | 00000016 | 00002aff | 000e636f | 64706f73 | 6974655f | 74797065 | 000aec1c |
| 0524540 | 000b8ffc | 00000000 | 0009dfa0 | 00000038 | b27cb66c | 00000160 | 00000183 | 0009dfa4 | 02000ce5 | 05001b0d | 00003627 | 00000013 |
| 0524620 | 00003867 | 005c1f63 | 0000024b | 00002aff | 2c780084 | 0002438a | 45b846ec | 93009afc | 001eaa18 | aab40030 | a3ecaa18 | aab40039 |
| 0524700 | a538aa18 | aab40030 | 94b0af48 | 723c9314 | 9afc001e | aa34aab4 | 0000a3ec | aa34aab4 | 0009a538 | aa34aab4 | 00309d88 | af34723c |
| 0524760 | 930093a8 | 002e9314 | 93a80029 | 42680000 | 0000004b | 42540000 | 00000003 | 3ba00000 | 000bdb18 | 0014aa34 | aab40030 | 9d88af34 |
| 0525040 | 723cc5a8 | 0009e414 | 00000038 | b27cb66c | 00000161 | 00000184 | 0009e020 | 02000ce5 | 05001b0d | 00003627 | 0000001b | 00003867 |
| 0525120 | 005bb723 | 0000024b | 00002aff | 2c780044 | 0002438a | 45dc46d8 | 475441fc | 00000123 | 42540000 | 00000013 | 3b4c0000 | 000bdb18 |
| 0525200 | 001c3348 | 3c480000 | 000bda78 | 0018aa50 | aab4003f | 9f24af48 | aa34aa18 | a354723c | 27f000d0 | 0009e18c | 5d100000 | 03003287 |
| 0525260 | 4b8c0000 | 00003b27 | 64205818 | 67b855f0 | 686855f0 | 69b05370 | 56f8671c | 53705aec | 020031f7 | 6110001c | 5d100000 | 02003ff7 |
| 0525340 | 67ec0018 | 5a180000 | 02003b27 | 65800020 | 5c9c0020 | 010036ef | 67ec0020 | 5c9c001c | 02000a3f | 66c00024 | 001c5ec0 | 00000024 |
| 0525420 | 02000887 | 6e0858e0 | 02003ff7 | 6c840018 | 6c840020 | 5c9c001c | 02000887 | 6d3c58e0 | 02003ff7 | 6c840018 | 6b74370c | 00184768 |
| 0525500 | 3540001c | 001c3228 | 320c42ac | 000036ef | 000d77f0 | 002033bc | 3e70001c | 3c480000 | 000d7810 | 0018386c | 3d302340 | 000d7830 |
| 0525560 | 000000a4 | 0009d8c | b27cb66c | 00000400 | 7fffffff | 0009e264 | 02000ce5 | 020031ed | 020031e5 | 00003b27 | 02000a3d | 030036bd |
| 0525640 | 000036ff | 0000000c | 00000010 | 02000a3d | 02000885 | 00002a4f | 00000014 | 02000885 | 000042e7 | 00000018 | 020031f5 | 02003ff5 |
| 0525720 | 0000001c | 02003b25 | 010036f4 | 00000020 | 00000024 | 02000a3d | 02000885 | 00000016 | 02003ff5 | 0000001e | 00000022 | 02000885 |
| 0526000 | 0000001a | 02003ff5 | 0000001e | 00000026 | 00002aff | 28c400d0 | 0009e300 | 5d100000 | 03003287 | 4b8c0000 | 00003b27 | 64205818 |
| 0526060 | 67b855f0 | 686855f0 | 69b05370 | 56f8671c | 53705aec | 020031f7 | 6110001c | 5d100000 | 02003ff7 | 67ec0018 | 5a180000 | 02003b27 |
| 0526140 | 65800020 | 5c9c0020 | 010036ff | 67ec0020 | 5c9c001c | 02000a3f | 66c00024 | 001c5ec0 | 00000024 | 02000887 | 6e0858e0 | 02003ff7 |
| 0526220 | 6c840018 | 6c840020 | 5c9c001c | 02000887 | 6d3c58e0 | 02003ff7 | 6c840018 | 6b74370c | 00184768 | 3540001c | 001c3228 | 320c42ac |
| 0526300 | 000036ff | 000d77f0 | 002033bc | 3e70001c | 3c480000 | 000d7810 | 0018386c | 3d302340 | 000d7830 | 000000a4 | 0009e0f0 | b27cb66c |
| 0526360 | 00000401 | 7fffffff | 0009e4ec | 02000ce5 | 020031ed | 020031e5 | 00003b27 | 02000a3d | 030036bd | 000036c7 | 0000000c | 00000010 |
| 0526440 | 02000a3d | 02000885 | 00002a4f | 00000014 | 02000885 | 000042e7 | 00000018 | 020031f5 | 02003ff5 | 0000001c | 02003b25 | 010036c5 |
| 0526520 | 00000020 | 00000024 | 02000a3d | 02000885 | 00000016 | 02003ff5 | 0000001e | 00000022 | 02000885 | 0000001a | 02003ff5 | 0000001e |
| 0526600 | 00000026 | 00002aff | 28c400d0 | 0009e574 | 51100000 | 03003287 | 4b8c0000 | 00003b27 | 64205818 | 67b855f0 | 686855f0 | 69b05370 |
| 0526660 | 56f8671c | 53705aec | 020031f7 | 6110001c | 5d100000 | 02003ff7 | 67ec0018 | 5a180000 | 02003b27 | 65800020 | 5c9c0020 | 010036c7 |
| 0526740 | 67ec0020 | 5c9c001c | 02000a3f | 66c00024 | 001c5ec0 | 00000024 | 02000887 | 6e0858e0 | 02003ff7 | 6c840018 | 6c840020 | 5c9c001c |
| 0527020 | 02000887 | 6d3c58e0 | 02003ff7 | 6c840018 | 6b74370c | 00184768 | 3540001c | 001c3228 | 320c42ac | 000036c7 | 000d77f0 | 002033bc |
| 0527100 | 3e70001c | 3c480000 | 000d7810 | 0018386c | 31302340 | 000d7830 | 000c6d6f | 72655f66 | 6163746f | 727300ff | 2c780030 | 0002438a |
| 0527160 | 45c446d8 | 334839f8 | 000bda78 | 0018aa50 | aab40200 | 9f24aab4 | 00049fe8 | ac08aa34 | a8589d88 | af34723c | 0009e47c | 00000038 |
| 0527240 | b27cb66c | 00000172 | 00000195 | 0009e480 | 02000ce5 | 05001b0d | 0000392f | 00000013 | 00003867 | 005eca83 | 0000024b | 00002aff |
| 0527320 | 2c780030 | 0002438a | 45c446d8 | 334839f8 | 000bda78 | 0018aa50 | aab40400 | 9f24aab4 | 00059fe8 | ac08aa34 | a8589db0 | af34723c |
| 0527400 | 0009e6b0 | 00000038 | b27cb66c | 00000173 | 00000196 | 0009e4ec | 02000ce5 | 05001b0d | 000034cf | 0000001b | 00003867 | 005ed8c3 |
| 0527460 | 0000024b | 00002aff | 2c780032 | 0002438a | 45d046d8 | 47549328 | 9afc0010 | aa18aa50 | a538aa50 | aa34a538 | 22a09328 | 93a8000a |
| 0527540 | 23fc0000 | 000bdb48 | c5a80000 | 00000090 | 0009e264 | b27cb66c | 00000402 | 7fffffff | 0009e628 | 02000ce5 | 020031e1 | 020031e5 |
| 0527620 | 00003b27 | 02000a3d | 02000885 | 00002a4f | 0000000c | 02000885 | 000042e7 | 00000010 | 020031f5 | 02003ff5 | 00000014 | 02003b25 |
| 0527700 | 010036ed | 00000018 | 0000001c | 02000a3d | 02000885 | 0000000e | 02003ff5 | 00000016 | 0000001a | 02000885 | 00000012 | 02003ff5 |
| 0527760 | 00000016 | 0000001e | 00002aff | 295400ac | 0002438a | 51100000 | 03003287 | 4b8c0000 | 00003b27 | 60cc56f8 | 671c55f0 | 682c5370 |
| 0530040 | 5d1867b8 | 53705c30 | 020031f7 | 6530001c | 5e540000 | 02003ff7 | 67ec0018 | 5a180000 | 02003b27 | 66700020 | 5c9c0020 | 010036ef |
| 0530120 | 67ec0020 | 5c9c001c | 02000a3f | 66c00024 | 001c5ec0 | 00000024 | 02000887 | 6b7458e0 | 02003ff7 | 6c840018 | 6c840020 | 5c9c001c |
| 0530200 | 02000887 | 6d3c58e0 | 02003ff7 | 6c840018 | 6c344768 | 33bc247c | 000d7810 | 0018386c | 3d302340 | 000d7830 | 0000008c | 0009e4ec |
| 0530260 | b27cb66c | 00000403 | 7fffffff | 0009e78c | 02000ce5 | 020031ed | 020031e5 | 00002a4f | 02000a3d | 02000885 | 00003b2f | 0000000c |
| 0530340 | 02000885 | 000042ef | 00000010 | 020031f5 | 02003ff5 | 00000014 | 02002a4d | 00000018 | 0000001c | 02000a3d | 02000885 | 0000000e |
| 0530420 | 02003ff5 | 00000016 | 0000001a | 02000885 | 00000012 | 02003ff5 | 00000016 | 0000001e | 00002aff | 0009e828 | 00000039 | b27cb66c |
| 0530500 | 00000404 | 00000433 | 0009e82c | 02000ce5 | 05001b0d | 00002a4f | 0000001b | 00002c07 | 006bc083 | 0000029b | 00002aff | 2c7800a0 |
| 0530560 | 0002438a | 5d100000 | 03003287 | 4b8c0000 | 00002a4f | 60cc56f8 | 671c55f0 | 682c5370 | 581867b8 | 53705c30 | 020031f7 | 6530001c |
| 0530640 | 5e540000 | 02003ff7 | 67ec0018 | 5a180000 | 02002a4f | 66700020 | 5c9c001c | 02000a3f | 66c00024 | 001c5ec0 | 00000024 | 02000887 |
| 0530720 | 6b7458e0 | 02003ff7 | 6c840018 | 6c840020 | 5c9c001c | 02000887 | 6d3c58e0 | 02003ff7 | 6c840013 | 6c344768 | 33bc247c | 000d78c8 |

| | | | | | | | | | | | | |
|---|---|---|---|---|---|---|---|---|---|---|---|---|
| 0531000 | 0018386c | 3d302340 | 000d78e8 | 000000a0 | 0009e628 | b27cb66c | 00000405 | 7fffffff | 0009e928 | 02000ce5 | 020031ed | 020031e5 |
| 0531060 | 000042e7 | 02000a3d | 030036bd | 000036ef | 0000000c | 00000010 | 02000a3d | 02000885 | 00002a4f | 00000014 | 02000885 | 000042e7 |
| 0531140 | 00000018 | 020031f5 | 02003ff5 | 0000001c | 020036ed | 00000020 | 00000024 | 02000a3d | 02000885 | 00000016 | 02003ff5 | 0000001e |
| 0531220 | 00000022 | 02000885 | 0000001a | 02003ff5 | 0000001e | 00000026 | 00002aff | 0009ed34 | 00000038 | b27cb66c | 00000406 | 00000434 |
| 0531300 | 0009f958 | 02000ce5 | 05001b0d | 000042e7 | 0000001b | 00002c07 | 006bc183 | 0000029b | 00002aff | 27f000c4 | 0009e9c0 | 5d100000 |
| 0531360 | 03003287 | 4b8c0000 | 000042e7 | 64205818 | 67b855f0 | 686855f0 | 69b05370 | 56f8671c | 53705aec | 020031f7 | 6110001c | 5d100000 |
| 0531440 | 02003ff7 | 67ec0018 | 5a180000 | 020036ef | 65800020 | 5c9c001c | 02000a3f | 66c00024 | 001c5ec0 | 00000024 | 02000887 | 6e0858e0 |
| 0531520 | 02003ff7 | 6c840018 | 6c840020 | 5c9c001c | 02000887 | 6d3c58e0 | 02003ff7 | 6c840018 | 6b74370c | 00184768 | 3540001c | 001c3228 |
| 0531600 | 320c42ac | 000036ef | 000d77f0 | 002033bc | 3e70001c | 3c480000 | 000d7810 | 0018386c | 3d302340 | 000d7830 | 000000a0 | 0009e78c |
| 0531660 | b27cb66c | 00000407 | 7fffffff | 0009ea8c | 02000ce5 | 020031ed | 020031e5 | 000042e7 | 02000a3d | 030036bd | 000036ff | 0000000c |
| 0531740 | 00000010 | 02000a3d | 02000885 | 00002a4f | 00000014 | 02000885 | 000042e7 | 00000018 | 020031f5 | 02003ff5 | 0000001c | 020036fd |
| 0532020 | 00000020 | 00000024 | 02000a3d | 02000885 | 00000016 | 02003ff5 | 0000001e | 00000022 | 02000885 | 0000001a | 02003ff5 | 0000001e |
| 0532100 | 00000026 | 00002aff | 28c400c4 | 0009eb24 | 5d100000 | 03003287 | 4b8c0000 | 000042e7 | 64205819 | 67b855f0 | 686855f0 | 69b05370 |
| 0532160 | 56f8671c | 53705aec | 020031f7 | 6110001c | 5d100000 | 02003ff7 | 67ec0018 | 5a180000 | 020036ff | 65800020 | 5c9c001c | 02000a3f |
| 0532240 | 66c00024 | 001c5ec0 | 00000024 | 02000887 | 6e0858e0 | 02003ff7 | 6c840018 | 6c840020 | 5c9c001c | 02000887 | 6d3c58e0 | 02003ff7 |
| 0532320 | 6c840018 | 6b74370c | 00184768 | 3540001c | 001c3228 | 320c42ac | 000036ff | 000d77f0 | 002033bc | 3e70001c | 3c480000 | 000d7810 |
| 0532400 | 0018386c | 3d302340 | 000d7830 | 000000a0 | 0009e928 | b27cb66c | 00000408 | 7fffffff | 0009ebf0 | 02000ce5 | 020031ed | 020031e5 |
| 0532460 | 000042e7 | 02000a3d | 030036bd | 000036c7 | 0000000c | 00000010 | 02000a3d | 02000885 | 00002a4f | 00000014 | 02000885 | 000042e7 |
| 0532540 | 00000018 | 020031f5 | 02003ff5 | 0000001c | 020036c5 | 00000020 | 00000024 | 02000a3d | 02000885 | 00000016 | 02003ff5 | 0000001e |
| 0532620 | 00000022 | 02000885 | 0000001a | 02003ff5 | 0000001e | 00000026 | 00002aff | 28c400c4 | 0009ec24 | 5d100000 | 03003287 | 4b8c0000 |
| 0532700 | 000042e7 | 64205818 | 67b855f0 | 686855f0 | 69b05370 | 56f8671c | 53705aec | 020031f7 | 6110001c | 5d100000 | 02003ff7 | 67ec0018 |
| 0532760 | 5a180000 | 020036c7 | 65800020 | 5c9c001c | 02000a3f | 66c00024 | 001c5ec0 | 00000024 | 02000887 | 6e0858e0 | 02003ff7 | 6c840018 |
| 0533040 | 6c840020 | 5c9c001c | 02000887 | 6d3c58e0 | 02003ff7 | 6c840018 | 6b74370c | 00184768 | 3540001c | 001c3228 | 320c42ac | 000036c7 |
| 0533120 | 000d77f0 | 002033bc | 3e70001c | 3c480000 | 000d7810 | 0018386c | 3d302340 | 000d7830 | 0000003c | 0009ea8c | b27cb66c | 00000409 |
| 0533200 | 7fffffff | 0009f8cc | 02000ce5 | 020031ed | 020031e5 | 000042e7 | 00000007 | 02003ff5 | 0000000c | 00000007 | 00002aff | 29540030 |
| 0533260 | 0002438a | 5d100000 | 03003287 | 4b8c0000 | 000042e7 | 537055f0 | 671c5370 | 5d100000 | 02003ff7 | 5fa05370 | 4960228c | 00136d6f |
| 0533340 | 72655f65 | 6c656d65 | 6e745f61 | 73736f63 | 73000ce7 | 0000002c | 000a0e00 | b27cb66c | 00000014 | 7fffffff | 0009ca5c | 02000ce5 |
| 0533420 | 0200293d | 00003157 | 000001e3 | 00002aff | 00003157 | b328b66c | 0009ec78 | 00000000 | 0009f0d0 | 000a67d4 | 002b2f68 | 6f6d652f |
| 0533500 | 6f736173 | 312f612f | 73726565 | 2f70726f | 6c6f672d | 74726961 | 6c732f64 | 6374672f | 64637467 | 3100ece2 | 0000002c | 0009ce80 |
| 0533560 | b27cb66c | 000000a3 | 7fffffff | 000acc34 | 02000ce5 | 02001f6d | 00003157 | 00002c07 | 00002aff | 27f00012 | 000acc58 | 4e1c0000 |
| 0533640 | 000033af | 228c2aff | 00003157 | b328e12a | 0009ecec | 00000000 | 0009ee20 | 00000034 | 0009ee20 | 0000002c | b27cb66c | 00000016 |
| 0533720 | 000000a2 | 0009cbc1 | 02000ce5 | 02002385 | 00003157 | 00002c07 | 00002aff | 0000331f | b3280343 | 0009ccfc | 00000000 | 00033c2d |
| 0534000 | 2d00cbe8 | 00332f68 | 6f6d652f | 6f736173 | 322f622f | 7175696e | 7475732f | 67656e65 | 7269632f | 71706c69 | 62322e35 | 2f6c6962 |
| 0534060 | 72617279 | 2f63616c | 6c000373 | 00362f68 | 6f6d652f | 6f736173 | 322f622f | 7175696e | 7475732f | 67656e65 | 7269632f | 71706c69 |
| 0534140 | 62322e35 | 2f6c6962 | 72617279 | 2f63616c | 6c2e706c | 0009edf2 | 0000002c | 000a8a24 | b27cb66c | 00000078 | 7fffffff | 000a488c |
| 0534220 | 02000ce5 | 0200293d | 000032a7 | 0000020b | 00002aff | 0009eee4 | 0000002c | b27cb66c | 0000007a | 0000007d | 0009cbc1 | 02000ce5 |
| 0534300 | 02002385 | 000032a7 | 00002c07 | 00002aff | 002f2f68 | 6f6d652f | 6f736173 | 312f612f | 73726565 | 2f70726f | 6c6f672d | 74726961 |
| 0534360 | 6c732f64 | 6374672f | 64637467 | 312f6f70 | 7300342c | 00322f68 | 6f6d652f | 6f736173 | 312f612f | 73726565 | 2f70726f | 6c6f672d |
| 0534440 | 74726961 | 6c732f64 | 6374672f | 64637467 | 312f6f70 | 732e706c | 0059332c | 0000002c | 000a2720 | b27cb66c | 0000004f | 7fffffff |
| 0534520 | 000a0e00 | 02000ce5 | 0200293d | 000031df | 000001f3 | 00002aff | 0009ef50 | 0000002c | b288b66c | 0000004e | 7fffffff | 0009eebc |
| 0534600 | 02000ce5 | 0100147d | 01002d65 | 0000000b | 00002aff | 0000002c | 000a2778 | b27cb66c | 0000005c | 7fffffff | 000a0e88 | 02000ce5 |
| 0534660 | 02001f6d | 000031df | 00002c07 | 00002aff | 27f00014 | 000a4770 | 4e1c0000 | 00000007 | 49602edc | 0009f03c | 0000002c | b27cb66c |
| 0534740 | 00000051 | 0000005b | 0009cbc1 | 02000ce5 | 02002385 | 0000311f | 00002c07 | 00002aff | 00000030 | 0006fca0 | b27cb66c | 00000052 |
| 0535020 | 7fffffff | 0009efb0 | 02000ce5 | 03002c3d | 00000887 | 00001903 | 00002d4f | 00002aff | 00000030 | 0009ef80 | b27cb66c | 00000053 |
| 0535100 | 7fffffff | 0009efe0 | 02000ce5 | 03002c3d | 000031e7 | 00002263 | 00002d2f | 00002aff | 00000030 | 0009efb0 | b27cb66c | 00000054 |
| 0535160 | 7fffffff | 0009f010 | 02000ce5 | 03002c3d | 000031ef | 00002583 | 00002d2f | 00002aff | 00000030 | 0009efe0 | b27cb66c | 00000055 |
| 0535240 | 7fffffff | 000c5288 | 02000ce5 | 03002c3d | 000031f7 | 000023f3 | 00002d2f | 00002aff | 0009f954 | 00000030 | b27cb66c | 00000056 |
| 0535320 | 00000206 | 0009f070 | 02000ce5 | 03002c3d | 000031ff | 00000c83 | 00002d4f | 00002aff | 0000002c | 000c6838 | b27cb66c | 0000022f |
| 0535400 | 7fffffff | 000b0d04 | 02000ce5 | 02001f6d | 00003a97 | 00002c07 | 00002aff | 000c6a18 | 0000002c | 000a8a7c | b27cb66c | 0000007e |
| 0535460 | 7fffffff | 000a48e4 | 02000ce5 | 02001f6d | 000032a7 | 00002c07 | 00002aff | 28c40014 | 000aeb58 | 4e1c0000 | 00000007 | 54a82edc |
| 0535540 | 29380022 | 000aa980 | 4e1c0000 | 0000083f | 49604a48 | 00184f6c | 0000001c | 0000083f | 2edc468c | 27f00034 | 0009f130 | 5d100000 |
| 0535620 | 020031ef | 61100018 | 5d100000 | 020031e7 | 671c5370 | 370c001c | 30503244 | 36644368 | 239c0000 | 000a46b0 | 28c4002c | 0009f15c |
| 0535700 | 5d100000 | 020031e7 | 671c5370 | 370c001c | 305043a4 | 00183244 | 36644368 | 239c0000 | 000a46b0 | 28c40084 | 0009f1e0 | 5d100000 |
| 0535760 | 020031ef | 671c687c | 00245aec | 020031e7 | 6a50671c | 5d7c0000 | 02000ce7 | 6af00028 | 6a003050 | 34c0001c | 35400018 | 002034a0 |
| 0536040 | 001c3410 | 002c4368 | 24d00000 | 000a4700 | 00303364 | 40b4002c | 000a4720 | 002c3984 | 001c0028 | 39840018 | 00243f68 | 00203eec |

1001

| | | | | | | | | | | | | |
|---|---|---|---|---|---|---|---|---|---|---|---|---|
| 0536120 | 001c3d48 | 3bf40000 | 000a46b0 | 001437f0 | 3cf4234c | 000a4740 | 29540048 | 0002438a | 5d100000 | 020031e7 | 64205b58 | 02000ce7 |
| 0536200 | 66200018 | 44a00000 | 02000ce7 | 6c840018 | 65f44408 | 020031e7 | 6c346b74 | 447c0000 | 020031ef | 6bf45370 | 239c0000 | 000a19d0 |
| 0536260 | 00000060 | 0009f230 | b0f8b66c | 00000059 | 7fffffff | 0008090d | 02000ce5 | 02002a5d | 0000000c | 00000010 | 02000a3d | 02000935 |
| 0536340 | 0050ce83 | 0200320d | 0000000e | 00000012 | 02000a3d | 0000083f | 02000935 | 003f5c63 | 01001b75 | 02000cdd | 00002c07 | 0000000e |
| 0536420 | 29540060 | 0002438a | 5d100000 | 03003287 | 4b9c0000 | 00004467 | 60cc56f8 | 671c5370 | 581867b8 | 53705c30 | 020031f7 | 6530001c |
| 0536500 | 5e540000 | 02003ebf | 67ec0019 | 55f067b8 | 53705ec0 | 0000001c | 02000887 | 6b7458e0 | 02004007 | 6c840018 | 6c3422bc | 000da91c |
| 0536560 | 000db090 | 28c40034 | 0009f320 | 56f8671c | 537057b8 | 67846b88 | 57b86750 | 53705ec0 | 0000001c | 03000da7 | 6c086b74 | 6c480018 |
| 0536640 | 239c0000 | 000aa9b8 | 28c4002e | 0009f350 | 56f8671c | 537057b8 | 67846b88 | 57b86b74 | 53705ec0 | 0000001c | 03000da7 | 6c086b74 |
| 0536720 | 6c480018 | 2edc725f | 28c40060 | 0009f3b0 | 56f8671c | 682c46ec | 57b86750 | 64505758 | 67506a50 | 48800018 | 001c5ec0 | 0000001c |
| 0537000 | 02000a3f | 67846af0 | 00205bc4 | 03000da7 | 6c086b74 | 6aa0247c | 000aa9b8 | 00243984 | 001c0020 | 39840018 | 001c38e8 | 45686dc4 |
| 0537060 | 6d502330 | 000a4700 | 28c40048 | 000aa9e0 | 56f86580 | 002057b8 | 67846b88 | 57b86c84 | 00206b74 | 5c9c001c | 02000a3f | 63d0001c |
| 0537140 | 51e80000 | 03000da7 | 6c086c94 | 002067b8 | 30504568 | 6b746b98 | 239c0000 | 000a4700 | 28c40058 | 0009f450 | 5d100000 | 02000a3f |
| 0537220 | 671c682c | 47684890 | 0018001c | 5c9c001c | 02000a3f | 67ec001c | 61f00020 | 10503520 | 001833bc | 24d00000 | 000a4700 | 00243984 |
| 0537300 | 001c0020 | 39840018 | 001c3da8 | 386c3130 | 24200000 | 000a4700 | 28c40040 | 0009f490 | 5d100000 | 02000887 | 61100020 | 57b86c84 |
| 0537360 | 00206b88 | 3678001c | 45506c48 | 00185370 | 45980018 | 6c086bb4 | 45506c84 | 00206c84 | 001822bc | 000a17fc | 29540034 | 0002438a |
| 0537440 | 57b867ec | 00206b88 | 3678001c | 45506c48 | 00185370 | 45980018 | 6c086bb4 | 45506c84 | 00206c84 | 001822bc | 000a17fc | 000be164 |
| 0537520 | 000be1a0 | 000be1c0 | 000be1e8 | 000be200 | 000be238 | 000be250 | 000be268 | 000be280 | 000be298 | 000be2b0 | 000be2c8 | 000be2e0 |
| 0537600 | 000be2f8 | 000be310 | 000be328 | 000be340 | 000be358 | 000be370 | 000be388 | 000be3a0 | 000be3b8 | 000be3d0 | 000be3e8 | 000be400 |
| 0537660 | 000be418 | 000be430 | 000be448 | 000be460 | 000be478 | 000be490 | 000be4a8 | 000be4c0 | 000be4d8 | 000be4f0 | 000be508 | 000be520 |
| 0537740 | 000be538 | 000be550 | 000be568 | 000be580 | 000be598 | 000be5b0 | 000be5c8 | 000be5e0 | 000be5f8 | 000be610 | 000be628 | 000be640 |
| 0540020 | 000be658 | 000be670 | 000be688 | 000be6a0 | 000be6b8 | 000be6d0 | 000be6e8 | 000be700 | 000be718 | 000be730 | 000be748 | 000be760 |
| 0540100 | 000be778 | 000be790 | 000be7a8 | 000be7c0 | 000be7d8 | 000be7f0 | 000be808 | 000be820 | 000be838 | 000be850 | 000be868 | 000be880 |
| 0540160 | 000be898 | 000be8b0 | 000be8c8 | 000be8e0 | 000be8f8 | 000be910 | 000be928 | 000be940 | 000be958 | 000be970 | 000be988 | 000be9a0 |
| 0540240 | 000be9b8 | 000be9d0 | 000be9e8 | 000bea00 | 000bea18 | 000bea30 | 000bea48 | 000bea60 | 000bea78 | 000bea90 | 000beaa8 | 000beac0 |
| 0540320 | 000bead8 | 000beaf0 | 000beb08 | 000beb20 | 000beb38 | 000beb50 | 000beb68 | 000beb80 | 000beb98 | 000bebb0 | 000bebc8 | 000bebe0 |
| 0540400 | 000bebf8 | 000bec10 | 000bec28 | 000bec40 | 000bec58 | 000bec70 | 000bec88 | 000beca0 | 000becb8 | 000becd0 | 000bece8 | 000bed00 |
| 0540460 | 000bed18 | 000bed30 | 000bed48 | 000bed60 | 000bed78 | 000bed90 | 000beda8 | 000bedc0 | 000bedd8 | 000bedf0 | 000bee08 | 000bee20 |
| 0540540 | 000bee38 | 000bee50 | 000bee68 | 000bee80 | 000bee98 | 000beeb0 | 000beec8 | 000beee0 | 000beef8 | 000bef10 | 000bef28 | 000bef40 |
| 0540620 | 000bef58 | 000bef70 | 000bef88 | 000befa0 | 000befb8 | 000befd0 | 000befe8 | 000bf000 | 000bf018 | 000bf030 | 000bf048 | 000bf060 |
| 0540700 | 000bf078 | 000bf090 | 000bf0a8 | 000bf0c0 | 000bf0d8 | 000bf0f0 | 000bf108 | 000bf120 | 000bf138 | 000bf150 | 000bf168 | 000bf180 |
| 0540760 | 000bf198 | 000bf1b0 | 000bf1c8 | 000bf1e0 | 000bf1f8 | 000bf210 | 000bf228 | 000bf240 | 000bf258 | 000bf270 | 000bf288 | 000bf2a0 |
| 0541040 | 000bf2b8 | 000bf2d0 | 000bf2e8 | 000bf300 | 000bf318 | 000bf330 | 000bf348 | 000bf360 | 000bf378 | 000bf390 | 000bf3a8 | 000bf3c0 |
| 0541120 | 000bf3d8 | 000bf3f0 | 000bf408 | 000bf420 | 000bf438 | 000bf450 | 000bf468 | 000bf480 | 000bf498 | 000bf4b0 | 000bf4c8 | 000bf4e0 |
| 0541200 | 000bf4f8 | 000bf510 | 000bf528 | 000bf540 | 000bf558 | 000bf570 | 000bf588 | 000bf5a0 | 000bf5b8 | 000bf5d0 | 000bf5e8 | 000bf600 |
| 0541260 | 000bf618 | 000bf630 | 000bf648 | 000bf660 | 000bf678 | 000bf690 | 000bf6a8 | 000bf6c0 | 000bf6d8 | 000bf6f0 | 000bf708 | 000bf720 |
| 0541340 | 000bf738 | 000bf750 | 000bf768 | 000bf780 | 000bf798 | 000bf7b0 | 000bf7c8 | 000bf7e0 | 000bf7f8 | 000bf810 | 000bf828 | 000bf840 |
| 0541420 | 000bf858 | 000bf870 | 000bf888 | 000bf8a0 | 000bf8b8 | 000bf8d0 | 000bf8e8 | 000bf900 | 000bf918 | 000bf930 | 000bf948 | 000bf960 |
| 0541500 | 000bf978 | 000bf990 | 000bf9a8 | 0000008c | 0009ebf0 | b27cb66c | 0000040a | 7fffffff | 0009fa30 | 02000ce5 | 020031ed | 020031e5 |
| 0541560 | 00003b2f | 02000a3d | 02000885 | 000042f7 | 0000000c | 02000885 | 000042ff | 00000010 | 020031f5 | 02003ff5 | 00000014 | 02003b2d |
| 0541640 | 00000018 | 0000001c | 02000a3d | 02000885 | 0000000e | 02003ff5 | 00000016 | 0000001a | 02000885 | 00000012 | 02003ff5 | 00000016 |
| 0541720 | 0000001e | 00002aff | 0009fcb0 | 00000038 | b27cb66c | 0000040b | 00000435 | 0009fcb4 | 02000ce5 | 05001b0d | 00003b2f | 0000001b |
| 0542000 | 00002c07 | 006bc643 | 0000027b | 00002aff | 27f000a0 | 0009faa0 | 5d100000 | 03003287 | 4b8c0000 | 00003b2f | 60cc56f8 | 671c55f0 |
| 0542060 | 682c5370 | 581867b8 | 53705c30 | 020031f7 | 6530001c | 5e540000 | 02003ff7 | 67ec0018 | 5a180000 | 02003b2f | 66700020 | 5c9c001c |
| 0542140 | 02000a3f | 66c00024 | 001c5ec0 | 00000024 | 02000887 | 6b7458e0 | 02003ff7 | 6c840018 | 6c840020 | 5c9c001c | 02000887 | 6d3c58e0 |
| 0542220 | 02003ff7 | 6c840018 | 6c344768 | 33bc247c | 000d79e0 | 0018386c | 3d302340 | 000d7a00 | 00000078 | 0009f8cc | b27cb66c | 0000040c |
| 0542300 | 7fffffff | 0009fb30 | 02000ce5 | 020031ed | 020031e5 | 00003b2f | 02000a3d | 02003645 | 0000335f | 0000000c | 02000a31 | 0000083f |
| 0542360 | 02000885 | 000042f7 | 00000010 | 020031f5 | 02003ff5 | 00000014 | 0100335d | 00000018 | 02000885 | 00000012 | 02003ff5 | 00000016 |
| 0542440 | 0000001a | 00002aff | 28c40088 | 0009fba4 | 51100000 | 03003287 | 4b8c0000 | 00003b2f | 60cc56f8 | 671c55f0 | 682c5370 | 501867b8 |
| 0542520 | 53705c30 | 020031f7 | 6530001c | 5e540000 | 02003ff7 | 67ec0018 | 5a180000 | 0100335f | 67b85ec0 | 0000001c | 02000887 | 6d3c58e0 |
| 0542600 | 02003ff7 | 6c840018 | 6c3436a4 | 476834e0 | 0018362c | 320c42ac | 0000335f | 000cc5cc | 00182ecc | 386c3d30 | 24200000 | 000d79e0 |
| 0542660 | 0000007c | 0009fa30 | b27cb66c | 0000040d | 7fffffff | 0009fc38 | 02000ce5 | 020031ed | 020031e5 | 00003b2f | 02000a3d | 01003365 |
| 0542740 | 000025c7 | 0000000c | 00000010 | 02000a3d | 0000083f | 02000885 | 000042f7 | 00000014 | 020031f5 | 02003ff5 | 00000018 | 010025c5 |
| 0543020 | 0000001c | 02000885 | 00000016 | 02003ff5 | 0000001a | 0000001e | 00002aff | 2954008c | 0002438a | 5d100000 | 03003287 | 4b8c0000 |
| 0543100 | 00003b2f | 64205818 | 67b855f0 | 682c5370 | 56f8671c | 53705aec | 020031f7 | 6110001c | 5d100000 | 02003ff7 | 67ec0018 | 5a180000 |
| 0543160 | 010025c7 | 671c5ec0 | 0000001c | 02000887 | 6d3c58e0 | 02003ff7 | 6c840018 | 6b74370c | 00184768 | 34e0001c | 3228320c | 43000000 |

1002

| | | | | | | | | | | | | |
|---|---|---|---|---|---|---|---|---|---|---|---|---|
| 0543240 | 000025c7 | 000d7a6c | 00182ecc | 386c3d30 | 24200000 | 000d79e0 | 0000007c | 0009fb30 | b27cb66c | 0000040e | 7fffffff | 0009fd78 |
| 0543320 | 02000ce5 | 020031ed | 020031e5 | 000042ff | 02000a3d | 03003365 | 00003687 | 0000000c | 00000010 | 02000a3d | 0000083f | 02000885 |
| 0543400 | 000042f7 | 00000014 | 020031f5 | 02003ff5 | 00000018 | 01003685 | 0000001c | 02000885 | 00000016 | 02003ff5 | 0000001a | 0000001e |
| 0543460 | 00002aff | 0009fe88 | 00000038 | b27cb66c | 0000040f | 00000436 | 0009fe8c | 02000ce5 | 05001b0d | 000042ff | 0000001b | 00002c07 |
| 0543540 | 006bd003 | 0000029b | 00002aff | 27f0008c | 0009fdac | 5d100000 | 03003287 | 4b8c0000 | 000042ff | 64205818 | 67b855f0 | 682c5370 |
| 0543620 | 56f8671c | 53705aec | 020031f7 | 6110001c | 51100000 | 02003ff7 | 67ec0018 | 5a180000 | 01003687 | 671c5ec0 | 0000001c | 02000887 |
| 0543700 | 6d3c58e0 | 02003ff7 | 6c840018 | 6b74370c | 00184768 | 34e0001c | 3228320c | 43000000 | 00003687 | 000d7a6c | 00182ecc | 386c3d30 |
| 0543760 | 24200000 | 000d79e0 | 0000003c | 0009fc38 | b27cb66c | 00000410 | 7fffffff | 0009fde4 | 02000ce5 | 020031ed | 020031e5 | 000042ff |
| 0544040 | 00000007 | 02003ff5 | 0000000c | 00000007 | 00002aff | 29540030 | 0002438a | 5d100000 | 03003287 | 4b8c0000 | 000042ff | 537055f0 |
| 0544120 | 671c5370 | 5d100000 | 02003ff7 | 5fa05370 | 4960228c | 000000a8 | 0009fd78 | b27cb66c | 00000411 | 7fffffff | 0009ff88 | 02000ce5 |
| 0544200 | 020031ed | 020031e5 | 000042ef | 02000a3d | 03003385 | 000036e7 | 0000000c | 00000010 | 02000a3d | 0000083f | 02000a3d | 02000885 |
| 0544260 | 00003b2f | 00000014 | 02000885 | 000042ef | 00000018 | 020031f5 | 02003ff5 | 0000001c | 020036e5 | 00000020 | 00000024 | 02000a3d |
| 0544340 | 02000885 | 00000016 | 02003ff5 | 0000001e | 00000022 | 02000885 | 0000001a | 02003ff5 | 0000001e | 00000026 | 00002aff | 000a0320 |
| 0544420 | 00000038 | b27cb66c | 00000412 | 00000437 | 000a0324 | 02000ce5 | 05001b0d | 000042ef | 0000001b | 00002c07 | 006bc743 | 0000029b |
| 0544500 | 00002aff | 27f000c4 | 000a0028 | 5d100000 | 03003287 | 4b8c0000 | 000042ef | 64205818 | 67b855f0 | 686855f0 | 69b05370 | 56f8671c |
| 0544560 | 53705aec | 020031f7 | 6110001c | 5d100000 | 02003ff7 | 67ec0018 | 5a180000 | 020036e7 | 65800020 | 5c9c001c | 02000a3f | 66c00024 |
| 0544640 | 001c5ec0 | 00000024 | 02000887 | 6e0858e0 | 02003ff7 | 6c840018 | 6c840020 | 5c9c001c | 02000887 | 6d3c58e0 | 02003ff7 | 6c840018 |
| 0544720 | 6b74370c | 00184768 | 3540001c | 001c3228 | 320c42ac | 000036e7 | 000d7b20 | 00202ecc | 33bc3e70 | 001c3aa0 | 000d78c8 | 0018386c |
| 0545000 | 3d302340 | 000d78e8 | 000000a8 | 0009fde4 | b27cb66c | 00000413 | 7fffffff | 000a00f4 | 02000ce5 | 020031ed | 020031e5 | 000042ef |
| 0545060 | 02000a3d | 03003385 | 0000370f | 0000000c | 00000010 | 02000a3d | 0000083f | 02000a3d | 02000885 | 00003b2f | 00000014 | 02000885 |
| 0545140 | 000042ef | 00000018 | 020031f5 | 02003ff5 | 0000001c | 0200370d | 00000020 | 00000024 | 02000a3d | 02000885 | 00000016 | 02003ff5 |
| 0545220 | 0000001e | 00000022 | 02000885 | 0000001a | 02003ff5 | 0000001e | 00000026 | 00002aff | 28c400c4 | 000a0194 | 5d100000 | 03003287 |
| 0545300 | 4b8c0000 | 000042ef | 64205818 | 67b855f0 | 686855f0 | 69b05370 | 56f8671c | 53705aec | 020031f7 | 6110001c | 5d100000 | 02003ff7 |
| 0545360 | 67ec0018 | 5a180000 | 0200370f | 65800020 | 5c9c001c | 02000a3f | 66c00024 | 001c5ec0 | 00000024 | 02000887 | 6e0858e0 | 02003ff7 |
| 0545440 | 6c840018 | 6c840020 | 5c9c001c | 02000887 | 6d3c58e0 | 02003ff7 | 6c840018 | 6b74370c | 00184768 | 3540001c | 001c3228 | 320c42ac |
| 0545520 | 0000370f | 000d7b20 | 00202ecc | 33bc3e70 | 001c3aa0 | 000d78c8 | 0018386c | 3d302340 | 000d78e8 | 000000a8 | 0009ff88 | b27cb66c |
| 0545600 | 00000414 | 7fffffff | 000a0260 | 02000ce5 | 020031ed | 020031e5 | 000042ef | 02000a3d | 03003385 | 0000246f | 0000000c | 00000010 |
| 0545660 | 02000a3d | 0000083f | 02000a3d | 02000885 | 00003b2f | 00000014 | 02000885 | 000042ef | 00000018 | 020031f5 | 02003ff5 | 0000001c |
| 0545740 | 0200246d | 00000020 | 00000024 | 02000a3d | 02000885 | 00000016 | 02003ff5 | 0000001e | 00000022 | 02000885 | 0000001a | 02003ff5 |
| 0546020 | 0000001e | 00000026 | 00002aff | 28c400c4 | 000a0294 | 5d100000 | 03003287 | 4b8c0000 | 000042ef | 64205818 | 67b855f0 | 686855f0 |
| 0546100 | 69b05370 | 56f8671c | 53705aec | 020031f7 | 6110001c | 5d100000 | 02003ff7 | 67ec0018 | 5a180000 | 0200246f | 65800020 | 5c9c001c |
| 0546160 | 02000a3f | 66c00024 | 001c5ec0 | 00000024 | 02000887 | 6e0858e0 | 02003ff7 | 6c840018 | 6c840020 | 5c9c001c | 02000887 | 6d3c58e0 |
| 0546240 | 02003ff7 | 6c840018 | 6b74370c | 00184768 | 3540001c | 001c3228 | 320c42ac | 0000246f | 000d7b20 | 00202ecc | 33bc3e70 | 001c3aa0 |
| 0546320 | 000d78c8 | 0018386c | 3d302340 | 000d78e8 | 0000003c | 000a00f4 | b27cb66c | 00000415 | 7fffffff | 000a02cc | 02000ce5 | 020031ed |
| 0546400 | 020031e5 | 000042ef | 00000007 | 02003ff5 | 0000000c | 00000007 | 00002aff | 29540030 | 0002438a | 5d100000 | 03003287 | 4b8c0000 |
| 0546460 | 000042ef | 537055f0 | 671c5370 | 5d100000 | 02003ff7 | 5fa05370 | 4960228c | 00000058 | 000a0260 | b27cb66c | 00000416 | 7fffffff |
| 0546540 | 000a03b0 | 02000ce5 | 020031ed | 020031e5 | 000042f7 | 02000885 | 00004307 | 0000000c | 020031f5 | 02003ff5 | 00000010 | 00000014 |
| 0546620 | 02000885 | 0000000e | 01003ff5 | 00000016 | 00002aff | 000a0814 | 00000038 | b27cb66c | 00000417 | 00000438 | 000a0818 | 02000ce5 |
| 0546700 | 05001b0d | 000042f7 | 0000001b | 00002c07 | 006bcf03 | 0000029b | 00002aff | 27f00054 | 000a0404 | 5d100000 | 03003287 | 4b8c0000 |
| 0546760 | 000042f7 | 60cc56f8 | 671c5370 | 581867b8 | 53705c30 | 020031f7 | 65300018 | 5e540000 | 02003ff7 | 5fa067b8 | 5c9c0018 | 02000887 |
| 0547040 | 6b7458e0 | 01003ff7 | 6c3422bc | 000d7bdc | 0000005c | 000a02cc | b27cb66c | 00000418 | 7fffffff | 000a0464 | 02000ce5 | 020031ed |
| 0547120 | 020031e5 | 000042f7 | 02000885 | 0000430f | 0000000c | 020031f5 | 02003ff5 | 00000010 | 00000014 | 02000885 | 0000000e | 02003ff5 |
| 0547200 | 00000012 | 00000016 | 00002aff | 28c40058 | 000a04b9 | 5d100000 | 03003287 | 4b8c0000 | 000042f7 | 60cc56f8 | 671c5370 | 581867b8 |
| 0547260 | 53705c30 | 020031f7 | 6530001c | 5e540000 | 02003ff7 | 66700018 | 5c9c001c | 02000887 | 6b7458e0 | 02003ff7 | 6c840018 | 6c3422bc |
| 0547340 | 000d7c3c | 0000005c | 000a03b0 | b27cb66c | 00000419 | 7fffffff | 000a0518 | 02000ce5 | 020031ed | 020031e5 | 000042f7 | 02000885 |
| 0547420 | 000024ff | 0000000c | 020031f5 | 02003ff5 | 00000010 | 00000014 | 02000885 | 0000000e | 0200412d | 00000012 | 00000016 | 00002aff |
| 0547500 | 28c40058 | 000a0584 | 5d100000 | 01003287 | 4b8c0000 | 000042f7 | 60cc56f8 | 671c5370 | 581867b8 | 53705c30 | 020031f7 | 6530001c |
| 0547560 | 5e540000 | 02003ff7 | 66700018 | 5c9c001c | 02000887 | 6b7458e0 | 0200412f | 6c840018 | 6c3422bc | 000cfff0 | 00000074 | 000a0464 |
| 0547640 | b27cb66c | 0000041a | 7fffffff | 000a0618 | 02000ce5 | 020031ed | 020031e5 | 000042f7 | 02000a3d | 010036d5 | 0000000c | 02000a3d |
| 0547720 | 02000885 | 00003b3f | 00000010 | 010036dd | 00000014 | 020031f5 | 02003ff5 | 00000018 | 0000001c | 02000885 | 00000012 | 02003ff5 |
| 0550000 | 0000001a | 0000001e | 00002aff | 28c4008c | 000a066c | 5d100000 | 03003287 | 4b8c0000 | 000042f7 | 60cc56f8 | 671c55f0 | 686855f0 |
| 0550060 | 69b05370 | 581867b8 | 53705c30 | 020031f7 | 6530001c | 5e540000 | 02003ff7 | 66700018 | 5c9c001c | 02000887 | 6e0858e0 | 02003ff7 |
| 0550140 | 6c840018 | 6c344768 | 34a0001c | 364035c8 | 31f0247c | 000cf098 | 002033bc | 3e70001c | 3c480000 | 000d72f4 | 001838d4 | 3d6037dc |
| 0550220 | 31f0234c | 000cf0d8 | 0000005c | 000a0518 | b27cb66c | 0000041b | 7fffffff | 000a06cc | 02000ce5 | 020031ed | 020031e5 | 000042f7 |
| 0550300 | 02000885 | 00004317 | 0000000c | 020031f5 | 02003ff5 | 00000010 | 00000014 | 02000885 | 0000000e | 02003ff5 | 00000012 | 00000016 |

| | | | | | | | | | | | | |
|---|---|---|---|---|---|---|---|---|---|---|---|---|
| 0550360 | 00002aff | 28c40058 | 000a0720 | 5d100000 | 03003287 | 4b8c0000 | 000042f7 | 60cc56f8 | 671c5370 | 581867b8 | 53705c30 | 020031f7 |
| 0550440 | 6530001c | 5e540000 | 02003ff7 | 66700018 | 5c9c001c | 02000887 | 6b7458e0 | 02003ff7 | 6c840018 | 6c3422bc | 000d7cc0 | 0000005c |
| 0550520 | 000a0618 | b27cb66c | 0000041c | 7fffffff | 000a0780 | 02000ce5 | 020031ed | 020031e5 | 000042f7 | 02000885 | 0000431f | 0000000c |
| 0550600 | 020031f5 | 02003ff5 | 00000010 | 00000014 | 02000885 | 0000000e | 02003ff5 | 00000012 | 00000016 | 00002aff | 29540058 | 0002438a |
| 0550660 | 5d100000 | 03003287 | 4b8c0000 | 000042f7 | 60cc56f8 | 671c5370 | 581867b8 | 53705c30 | 020031f7 | 6530001c | 5e540000 | 02003ff7 |
| 0550740 | 66700018 | 5c9c001c | 02000887 | 6b7458e0 | 02003ff7 | 6c840018 | 6c3422bc | 000d7cf8 | 00000098 | 000a06cc | b27cb66c | 0000041d |
| 0551020 | 7fffffff | 000a094c | 02000ce5 | 020031ed | 020031e5 | 0000431f | 02000a3d | 02000885 | 00003c5f | 0000000c | 02000a3d | 010036cd |
| 0551100 | 00000010 | 02000885 | 00004317 | 00000014 | 020031f5 | 02003ff5 | 00000018 | 0200431d | 0000001c | 00000020 | 02000a3d | 02000885 |
| 0551160 | 0000000e | 02004005 | 0000001a | 0000001e | 02000885 | 00000016 | 02003ff5 | 0000001a | 00000022 | 00002aff | 000a0b94 | 00000078 |
| 0551240 | b27cb66c | 0000041e | 00000439 | 000a0b98 | 02000ce5 | 05001b0d | 0000431f | 0000001b | 00002c07 | 006be7c3 | 0000029b | 00002aff |
| 0551320 | 000a0b94 | 00000040 | 000d7d9c | 000d7d20 | 000d7e2c | 000d7eb0 | 00000000 | 00000000 | 00000000 | 00000000 | 00000000 | 00000000 |
| 0551400 | 00000000 | 000d7b00 | 000d7bbc | 000d7a94 | 27f000bc | 000a09f4 | 5d100000 | 03003287 | 4b8c0000 | 0000431f | 60cc56f8 | 671c55f0 |
| 0551460 | 686855f0 | 69b05370 | 581867b8 | 53705c30 | 020031f7 | 6530001c | 5e540000 | 02003ff7 | 67ec0018 | 5a180000 | 0200431f | 66700020 |
| 0551540 | 5c9c001c | 02000a3f | 66c00024 | 001c5ec0 | 00000024 | 02000887 | 6b7458e0 | 02004007 | 6c840018 | 6c840020 | 5c9c001c | 02000887 |
| 0551620 | 6d3c58e0 | 02003ff7 | 6c840018 | 6c344768 | 3410001c | 24d00000 | 000cf0f8 | 0020344c | 3eec001c | 381831f0 | 24d00000 | 000d79c0 |
| 0551700 | 0018386c | 3d302340 | 000d7cc0 | 000000b0 | 000a0780 | b27cb66c | 0000041f | 7fffffff | 000a0af4 | 02000ce5 | 020031ed | 020031e5 |
| 0551760 | 0000431f | 02000a3d | 02000885 | 00003c5f | 0000000c | 02000a3d | 010036cd | 00000010 | 02000a3d | 010036d5 | 00000014 | 02000a3d |
| 0552040 | 02000885 | 00003b3f | 00000018 | 010036dd | 0000001c | 020031f5 | 02003ff5 | 00000020 | 0200431d | 00000024 | 00000029 | 02000a3d |
| 0552120 | 02000885 | 0000000e | 02004005 | 00000022 | 00000026 | 02000885 | 0000001a | 02003ff5 | 00000022 | 0000002a | 00002aff | 295400f8 |
| 0552200 | 0002438a | 5d100000 | 03003287 | 4b8c0000 | 0000431f | 60cc56f8 | 671c55f0 | 687c0028 | 55f06af0 | 002055f0 | 6aa055f0 | 69b05370 |
| 0552260 | 581867b8 | 53705c30 | 020031f7 | 6530001c | 5e540000 | 02003ff7 | 67ec0018 | 5a180000 | 0200431f | 66700020 | 5c9c001c | 02000a3f |
| 0552340 | 66c00024 | 001c5ec0 | 00000024 | 02000887 | 6b7458e0 | 02004007 | 6c840018 | 6c840020 | 5c9c001c | 02000887 | 6e0858e0 | 02003ff7 |
| 0552420 | 6c840018 | 6c344768 | 3410002c | 24d00000 | 000cf0f8 | 003034a0 | 0024 3eec | 002c382c | 002831f0 | 24d00000 | 000d79c0 | 002834a0 |
| 0552500 | 001c3eec | 0024382c | 002031f0 | 24d00000 | 000cf098 | 002033bc | 3e70001c | 3c480000 | 000d72f4 | 001838d4 | 3d6037dc | 31f0234c |
| 0552560 | 000cf0d8 | 000000a4 | 000a094c | b27cb66c | 00000420 | 7fffffff | 000a0cb0 | 02000ce5 | 020031ed | 020031e5 | 00004317 | 02000a3d |
| 0552640 | 010036d5 | 0000000c | 02000a3d | 02000885 | 00004327 | 00000010 | 02000a3d | 02000885 | 0000432f | 00000014 | 010036dd | 00000018 |
| 0552720 | 020031f5 | 02003ff5 | 0000001c | 02004315 | 00000020 | 00000024 | 02000a3d | 02000885 | 00000012 | 02003ff5 | 0000001e | 00000022 |
| 0553000 | 02000885 | 00000016 | 02003ff5 | 0000001e | 00000026 | 00002aff | 000a0d44 | 00000038 | b27cb66c | 00000421 | 0000043a | 000a0d48 |
| 0553060 | 02000ce5 | 05001b0d | 00004317 | 0000001b | 00002c07 | 006be603 | 0000029b | 00002aff | 2c7800e0 | 0002438a | 5d100000 | 03003287 |
| 0553140 | 4b8c0000 | 00004317 | 60cc56f8 | 671c55f0 | 687c0020 | 55f06aa0 | 55f069b0 | 53705818 | 67b85370 | 5e540000 | 020031f7 | 6530001c |
| 0553220 | 5e540000 | 02003ff7 | 67ec0018 | 5a180000 | 02004317 | 66700020 | 5c9c001c | 02000a3f | 66c00024 | 001c5ec0 | 00000024 | 02000897 |
| 0553300 | 6e580020 | 5a180000 | 02003ff7 | 6c840018 | 6c840020 | 5c9c001c | 02000887 | 6e0858e0 | 02003ff7 | 6c840018 | 6c344768 | 34a00024 |
| 0553360 | 364035c8 | 31f0247c | 000cf098 | 00283410 | 001c3e70 | 00243c9c | 00000020 | 000d7dbc | 002033bc | 3e70001c | 3c480000 | 000d7ddc |
| 0553440 | 001838d4 | 3d6037dc | 31f0234c | 000cf0d8 | 00000098 | 000a0af4 | b27cb66c | 00000422 | 7fffffff | 000a2460 | 02000ce5 | 020031ed |
| 0553520 | 020031e5 | 00004327 | 02000a3d | 02000885 | 00004337 | 0000000c | 02000a3d | 0100367d | 00000010 | 02000885 | 00003b3f | 00000014 |
| 0553600 | 020031f5 | 02003ff5 | 00000018 | 02004325 | 0000001c | 00000020 | 02000a3d | 02000885 | 0000000e | 02003eb3 | 0000001a | 0000001e |
| 0553660 | 02000885 | 00000016 | 02003ff5 | 0000001a | 00000022 | 00002aff | 000a1588 | 00000038 | b27cb66c | 00000423 | 0000043b | 000a289c |
| 0553740 | 02000ce5 | 05001b0d | 00004327 | 0000001b | 00002c07 | 006bede3 | 0000029b | 00002aff | 28c40060 | 0009f288 | 5d100000 | 03003287 |
| 0554020 | 4b8c0000 | 00004467 | 60cc56f8 | 671c5370 | 581867b8 | 53705c30 | 020031f7 | 6530001c | 5e540000 | 02003ebf | 67ec0018 | 55f067b8 |
| 0554100 | 53705ec0 | 0000001c | 02000887 | 6b7458e0 | 02003ff7 | 6c840018 | 6c3422bc | 000d7538 | 0008015c | 0400373f | 00002c07 | 00000010 |
| 0554160 | 000e618c | 000e618c | 0001005a | 00000000 | 0000002c | 0009eebc | b27cb66c | 00000018 | 7fffffff | 0009ec74 | 02000ce5 | 0200293d |
| 0554240 | 0000316f | 000001eb | 00002aff | 0000316f | b328b66c | 000a0e04 | 00000000 | 000032d7 | b328cbe8 | 000aac18 | 00000000 | 00057365 |
| 0554320 | 6d6f7000 | 002e2f68 | 6f6d652f | 6f736173 | 322f622f | 7175696e | 7475732f | 67656e65 | 7269632f | 71706c69 | 62322e35 | 2f6c6962 |
| 0554400 | 72617279 | 00000000 | 0000002c | 0009ef14 | b27cb66c | 0000003d | 7fffffff | 000a0eed | 02000ce5 | 0200lf6d | 0000316f | 00001c67 |
| 0554460 | 00002aff | 000e7472 | 616e736c | 6174655f | 69656164 | 00000000 | 29c80000 | 000a2344 | 0009f2f6 | 00137374 | 7269705f | 6d6f6475 |
| 0554540 | 6c655f70 | 72656669 | 78000000 | 0000002c | 000a0eec | b4f0b4e4 | 0000003c | 7fffffff | 0007f2ad | 000000fc | 00000024 | 0009cb94 |
| 0554620 | 0002438a | 000e9c88 | 2c780010 | 0002438a | 239c0000 | 000a1264 | 0000316f | b328cbe8 | 000a0e8c | 00000000 | 00036f70 | 73000000 |
| 0554700 | 0000002c | 000bb77c | b27cb66c | 0000001c | 7fffffff | 00093 6f0 | 02000ce5 | 020024a5 | 00001c67 | 0000316f | 00002aff | 0000002c |
| 0554760 | 000a0f6c | b4f0b4e4 | 0000001b | 7fffffff | 0007fc0d | 0000000c | 00000003 | 000a0f40 | 0002438a | 000be0f0 | 00001c67 | b3280000 |
| 0555040 | 000a0f44 | 00000000 | 00080adc | 02001b47 | 03001c67 | 00000008 | 000a17b0 | 000a183c | 0001003d | 00000000 | 00000034 | 00073678 |
| 0555120 | b27cb66c | 0000001d | 7fffffff | 000a103c | 02000ce5 | 04002105 | 00001b47 | 00000013 | 00001c67 | 00001ef7 | 00002aff | 00001b47 |
| 0555200 | b3280000 | 000a0fcc | 00000000 | 000952ac | 00000000 | 000a0ff4 | 000a1004 | 0007ed3c | 02001c67 | 00001c67 | 00000008 | 000a1cf8 |
| 0555260 | 000a1d84 | 0001003d | 00000000 | 00000034 | 000a0fc8 | b27cb66c | 0000001e | 7fffffff | 000a109c | 02000ce5 | 04002105 | 00001c67 |
| 0555340 | 00000013 | 00001c67 | 00001ef7 | 00002aff | b4640000 | 000a1040 | 000a10c8 | 000a1014 | 03001c67 | 00001c67 | 0000000c | 000a1e04 |
| 0555420 | 000a1e68 | 0001003d | 00000000 | 00000034 | 000a103c | b27cb66c | 0000001f | 7fffffff | 000a10fc | 02000ce5 | 04002105 | 00001c67 |

| | | | | | | | | | | | | |
|---|---|---|---|---|---|---|---|---|---|---|---|---|
| 0555500 | 0000001b | 00001c67 | 00001ef7 | 00002aff | b4640000 | 000a10a0 | 000a1128 | 000a1074 | 04001c67 | 00001c67 | 00000010 | 000a1ee8 |
| 0555560 | 000a1f60 | 0001003d | 00000000 | 00000034 | 000a109c | b27cb66c | 00000020 | 7fffffff | 000a115c | 02000ce5 | 04002105 | 00001c67 |
| 0555640 | 00000023 | 00001c67 | 00001ef7 | 00002aff | b4640000 | 000a1100 | 000a1188 | 000a10d4 | 05001c67 | 00001c67 | 00000014 | 000a1fe8 |
| 0555720 | 000a2078 | 0001003d | 00000000 | 00000034 | 000a10fc | b27cb66c | 00000021 | 7fffffff | 000a11bc | 02000ce5 | 04002105 | 00001c67 |
| 0556000 | 0000002b | 00001c67 | 00001ef7 | 00002aff | b4640000 | 000a1160 | 000a11e8 | 000a1134 | 06001c67 | 00001c67 | 00000018 | 000a2100 |
| 0556060 | 000a21a8 | 0001003d | 00000000 | 00000034 | 000a115c | b27cb66c | 00000022 | 7fffffff | 000a121c | 02000ce5 | 04002105 | 00001c67 |
| 0556140 | 00000033 | 00001c67 | 00001ef7 | 00002aff | b4640000 | 000a11c0 | 000a1248 | 000a1194 | 07001c67 | 00001c67 | 0000001c | 000a2238 |
| 0556220 | 000a22f4 | 0001003d | 00000000 | 00000034 | 000a11bc | b27cb66c | 00000023 | 7fffffff | 000a127c | 02000ce5 | 04002105 | 00001c67 |
| 0556300 | 0000003b | 00001c67 | 00001ef7 | 00002aff | b4640000 | 000a1220 | 00000000 | 0007f69c | 0400317f | 00001c67 | 00000010 | 000a16f4 |
| 0556360 | 000a1740 | 0001003d | 00000000 | 00000034 | 000a121c | b27cb66c | 00000024 | 7fffffff | 0009d71c | 02000ce5 | 04002105 | 0000317f |
| 0556440 | 00000023 | 00001c67 | 00001ef7 | 00002aff | 0000317f | b3280000 | 000a1280 | 00000000 | 00000034 | 00073e48 | b27cb66c | 00000025 |
| 0556520 | 7fffffff | 000a1304 | 02000ce5 | 020024ad | 02001b45 | 00000c4f | 00000a37 | 00001c67 | 00002aff | 02001b47 | b3280000 | 000a12c4 |
| 0556600 | 00000000 | 00000034 | 000a12c0 | b27cb66c | 00000026 | 7fffffff | 000a1358 | 02000ce5 | 020024ad | 02001c65 | 0000000b | 00000d6f |
| 0556660 | 00001c67 | 00002aff | 02001c67 | b3280000 | 000a1308 | 00000000 | 00094190 | 00000000 | 000a1330 | 000a1340 | 00000038 | 000a1304 |
| 0556740 | b27cb66c | 00000027 | 7fffffff | 000a13a8 | 02000ce5 | 020024ad | 03001c65 | 00000013 | 00000d6f | 00000d6f | 00001c67 | 00002aff |
| 0557020 | 03001c67 | b3280000 | 000a135c | 00000000 | 000a1388 | 000a1348 | 0000003c | 000a1358 | b27cb66c | 00000028 | 7fffffff | 000a13fc |
| 0557100 | 02000ce5 | 020024ad | 04001c65 | 0000001b | 00000d6f | 00000d6f | 00000d6f | 00001c67 | 00002aff | 04001c67 | b3280000 | 000a13ac |
| 0557160 | 00000000 | 000a13dc | 000a1398 | 00000040 | 000a13a8 | b27cb66c | 00000029 | 7fffffff | 000a1454 | 02000ce5 | 020024ad | 05001c65 |
| 0557240 | 00000023 | 00000d6f | 00000d6f | 00000d6f | 00000d6f | 00001c67 | 00002aff | 05001c67 | b3280000 | 000a1400 | 00000000 | 000a1434 |
| 0557320 | 000a13ec | 00000044 | 000a13fc | b27cb66c | 0000002a | 7fffffff | 000a14b0 | 02000ce5 | 020024ad | 06001c65 | 0000002b | 00000d6f |
| 0557400 | 00000d6f | 00000d6f | 00000d6f | 00000d6f | 00001c67 | 00002aff | 06001c67 | b3280000 | 000a1458 | 00000000 | 000a1490 | 000a1444 |
| 0557460 | 00000048 | 000a1454 | b27cb66c | 0000002b | 7fffffff | 000736ad | 02000ce5 | 020024ad | 07001c65 | 00000033 | 00000d6f | 00000d6f |
| 0557540 | 00000d6f | 00000d6f | 00000d6f | 00000d6f | 00001c67 | 00002aff | 07001c67 | b3280000 | 000a14b4 | 00000000 | 000a14f0 | 000a14a0 |
| 0557620 | 000b6170 | 70656e64 | 5f746572 | 6d000000 | 000c6170 | 70656e64 | 5f746572 | 6d310000 | 000c6170 | 70656e64 | 5f746572 | 6d320000 |
| 0557700 | 00077363 | 63735f69 | 64000000 | 001b2240 | 29232938 | 382f3039 | 2f313920 | 63616c6c | 2e706c09 | 32372e31 | 22000000 | ffffffff |
| 0557760 | 0100319f | 00001c67 | 00000004 | 000a165c | 000a165c | 0001003d | 00000000 | 000a1684 | 00000064 | b27cb66c | 0000002c | 0000003f |
| 0560040 | 000a1688 | 02000ce5 | 05001b0d | 0000319f | 0000000b | 00001c67 | 0050aba3 | 000001eb | 00002aff | 000a1684 | 0000002c | b4f0b4e4 |
| 0560120 | 0000002b | 7fffffff | 0007eaad | 00000000 | 00000000 | 000a21fc | 0002438a | 000a2660 | 000031ff | b3280000 | 000c528c | 00000000 |
| 0560200 | 00000028 | 0009a4f8 | b27cb66c | 0000002d | 7fffffff | 000bd9b8 | 02000ce5 | 01002c35 | 00001c67 | 00002aff | 00001c67 | b3280000 |
| 0560260 | 000a1604 | 00000000 | 000bd9d8 | 000a1640 | 00000000 | 00000008 | 000a1620 | 00000000 | 2c780012 | 0002438a | 4e1c0000 | 000031a7 |
| 0560340 | 228c0000 | 2cac0000 | 0002438a | 2ca00000 | 00000000 | 00000001 | 000a1648 | 000a1648 | 0002438a | 0009a544 | 000a175c | 00000038 |
| 0560420 | b27cb66c | 0000002e | 00000040 | 000a1760 | 02000ce5 | 05001b0d | 0000317f | 00000023 | 00001c67 | 00509323 | 000001eb | 00002aff |
| 0560500 | 000031f7 | b3280000 | 0007f014 | 00000000 | 00036c65 | 6e0016d9 | 000a19ec | 00000000 | 000a1a2d | 00000000 | 29380014 | 000a1718 |
| 0560560 | 4e1c0000 | 00000003 | 3050c5a8 | 27f00000 | 000a1740 | 2ca00000 | 00000004 | 00000002 | 000a16e0 | 000a1740 | 0002438a | 000a1738 |
| 0560640 | 28c40020 | 000a1740 | 54100000 | 02000cdf | 65800018 | 30503614 | 001822bc | 000a1264 | 000a16ec | 000a1724 | 29540016 | 0002438a |
| 0560720 | 495049b8 | 92949410 | 92a89860 | 228c0000 | 000a1870 | 00000038 | b27cb66c | 0000002f | 00000041 | 000a1874 | 02000ce5 | 05001b0d |
| 0561000 | 00001b47 | 00000013 | 00001c67 | 00507d83 | 000001eb | 00002aff | 000031ef | b3280000 | 0009efe4 | 00000000 | 000031e7 | b3280000 |
| 0561060 | 0009efb4 | 00000000 | 27f0003c | 000a183c | 25204714 | 343033d8 | 42540000 | 00002c07 | 24d00000 | 000a1264 | 001c33bc | 3818408c |
| 0561140 | 000a17fc | 00142ecc | 3d303cf4 | 242c0000 | 0007e68c | ffffffff | 03003187 | 00001c67 | 0000000c | 000a18c4 | 000a18c4 | 0001003d |
| 0561220 | 00000000 | 002a7e4e | 21206261 | 64206172 | 67756d65 | 6e747320 | 746f2061 | 70706c79 | 2f327e6e | 2120476f | 615c3a20 | 7e717e6e |
| 0561300 | 00000000 | 29540030 | 0002438a | 2520442c | 02001b47 | 6b486b88 | 45686c34 | 537041e8 | 000031af | 43000000 | 00002c0f | 0007f4ac |
| 0561360 | 000cc5a8 | 000a197c | 00000038 | b27cb66c | 00000030 | 00000042 | 000a1980 | 02000ce5 | 05001b0d | 00003187 | 0000001b | 00001c67 |
| 0561440 | 0050bfe3 | 000001eb | 00002aff | 0000324f | b328cbe8 | 000a277c | 00000000 | 00022d3d | 000a18bc | 00023c24 | 00000000 | 2c780054 |
| 0561520 | 0002438a | 45c44714 | 476833a0 | 3380001c | 37886f34 | 9350001c | 98603410 | 002037dc | 3c480000 | 000a1928 | 00243eec | 00203e70 |
| 0561600 | 001c379c | 6f34386c | 37dc3aa0 | 000a1940 | 0018386c | 37f03cf4 | 242c0000 | 000a1968 | ffffffff | 030031b7 | 00001c67 | 0000000c |
| 0561660 | 000a19f4 | 000a19f4 | 0001003d | 00000000 | 0007f6bc | 0300318f | 00001c67 | 0000000c | 000a1ad0 | 000a1ad0 | 0001003d | 00000000 |
| 0561740 | ffffffff | 03003197 | 00001c67 | c000000c | 000a1b90 | 000a1b90 | 0001003d | 00000000 | 000a1a58 | 00000039 | b27cb66c | 00000031 |
| 0562020 | 00000043 | 000a1a5c | 02000ce5 | 05001b0d | 000031b7 | 0000001b | 00001c67 | 0050c943 | 000001eb | 00002aff | 000031df | b328cbe8 |
| 0562100 | 0009ef18 | 00000000 | ffffffff | 0200320f | 00002c07 | 00000008 | 000a46c0 | 000a46c0 | 0001003e | 00000000 | 27f00014 | 000a1a19 |
| 0562160 | 4e1c0000 | 00000003 | 3050c5a8 | 2cac0000 | 0002438a | 2ca00000 | 00000004 | 00000002 | 000a19e0 | 000a1a34 | 000a1a3e | 000a16d8 |
| 0562240 | 28c40014 | 000a1a34 | 4e1c0000 | 00000007 | 4960228c | 000a1a24 | 000a16d0 | 29540020 | 0002438a | 56f85fa0 | 671cbfcc | a874aaf0 |
| 0562320 | 0001ac4c | 239c0000 | 000a1928 | 000a1b4c | 00000038 | b27cb66c | 00000032 | 00000044 | 000a1b50 | 02000ce5 | 05001b0d | 0000318f |
| 0562400 | 0000001b | 00001c67 | 0050ca43 | 000001eb | 00002aff | 27f00044 | 000a1af4 | 56f867b8 | 55f06868 | 69b04728 | 001c4768 | 3050aa88 |
| 0562460 | 001caaf0 | 0001ac08 | 36643804 | 6e74aa88 | 001caaf0 | 0002ada8 | 38803804 | 37886e74 | 23fc0000 | 000a1943 | 2cac77a0 | 0002438a |
| 0562540 | 2ca01ad8 | 00000000 | 00000001 | 000a1a8c | 000a1b34 | 000a1b28 | 0009cb54 | 28c40026 | 000a1b34 | 56f867ec | 00185370 | 36b83050 |

| | | | | | | | | | | | | |
|---|---|---|---|---|---|---|---|---|---|---|---|---|
| 0562620 | a974aaf0 | 0001ac08 | 36780018 | 36006e74 | 72201a84 | 2b24f1e8 | 0002438a | 000a1afe | 29c8f1a9 | 000a1b1c | 000a1a96 | 29540012 |
| 0562700 | 0002438a | 4e1c0000 | 00000007 | 228cce0c | 000a1c40 | 00000038 | b27cb66c | 00000033 | 00000045 | 000a1c44 | 02000ce5 | 05001b0d |
| 0562760 | 00003197 | 0000001b | 00001c67 | 0050cb43 | 000001eb | 00002aff | 00000887 | b3280000 | 0009ef84 | 00000000 | 2c78008a | 0002438a |
| 0563040 | 45dc4700 | 4740aa6c | aab40001 | a4bc004e | 34100024 | 380437b0 | 6e743eec | 002437dc | 37b06e74 | aa6caaf0 | ffffae74 | 001c3410 |
| 0563120 | 00203804 | 37c4001c | 6e743eec | 002037dc | 37c4001c | 6e74aa88 | 001caaf0 | ffffac08 | 38443804 | 242c0000 | 000a1968 | aa6caab4 |
| 0563200 | 0000a4bc | 001c33bc | 380441d4 | 0000000b | 6e743d60 | 37dc41d4 | 0000000b | 6e74723c | 22a004e3 | 000a17ec | 04003187 | 00001c67 |
| 0563260 | 00000010 | 000a1c80 | 000a1c80 | 0001003d | 00000000 | 000a1cb4 | 00000044 | b27cb66c | 00000034 | 00000046 | 000a1cb8 | 02000ce5 |
| 0563340 | 05001b0d | 00003187 | 00000023 | 00001c67 | 0050e163 | 000001eb | 00002aff | 000a1cb4 | 0000000c | 00000000 | 2c780030 | 0002438a |
| 0563420 | 45c44728 | 001c4740 | 47d03844 | 33643788 | 6f34aa18 | aa88001c | 9d88ac90 | 3d48379c | 6f34231c | 000a1968 | 000a1dc4 | 00000038 |
| 0563500 | b27cb66c | 00000035 | 00000047 | 000a1dc8 | 02000ce5 | 05001b0d | 00001c67 | 00000013 | 00001c67 | 00508123 | 000001eb | 00002aff |
| 0563560 | 000031df | b328f8bc | 0009eec0 | 00000000 | 27f00050 | 000a1d84 | 25204700 | 34303410 | 001c41e8 | 00002c07 | 24d00000 | 000a1264 |
| 0563640 | 0020344c | 33f441e8 | 0000000b | 40b4001c | 000a1c2c | 001c2ecc | aa6caaf0 | 0001ac08 | 386c37f0 | 6e743d30 | 3cf4234c | 0007e68c |
| 0563720 | 00397e4e | 21203173 | 74206172 | 67756d65 | 6e74206f | 66206361 | 6c6c2f7e | 71206973 | 206e6f74 | 2063616c | 6c61626c | 657e6e21 |
| 0564000 | 20476f61 | 6c3a207e | 717e6e00 | 2954003c | 0002438a | 25204408 | 02001c67 | 6b486b88 | 45386bf4 | 53704568 | 4b8c0000 | 00000013 |
| 0564060 | 6b7441e8 | 000031bf | 43000000 | 00002c0f | 0007f4ac | 000cc5a8 | 000a1ea8 | 00000038 | b27cb66c | 00000036 | 00000048 | 000a1eac |
| 0564140 | 02000ce5 | 05001b0d | 00001c67 | 0000001b | 00001c67 | 00508423 | 000001eb | 00002aff | 00066d79 | 72657631 | 000a1edc | 27f00064 |
| 0564220 | 000a1e68 | 25204728 | 001c4768 | 34303410 | 002041e8 | 00002c07 | 24d00000 | 000a1264 | 0024344c | 33f441e8 | 00000013 | 40b40020 |
| 0564300 | 000a1c2c | 00202ecc | aa6caaf0 | 0001ac08 | 3894001c | 37f06e74 | aa6caaf0 | 0002ac08 | 386c37f0 | 6e743d30 | 3cf4234c | 0007e68c |
| 0564360 | 2954003c | 0002438a | 2520442c | 03001c67 | 6b486b88 | 6bc84538 | 6c345370 | 45684af8 | 0000001b | 6b7441e8 | 000031bf | 43000000 |
| 0564440 | 00002c0f | 0007f4ac | 000cc5a8 | 000a1fa8 | 00000038 | b27cb66c | 00000037 | 00000049 | 000a1fac | 02000ce5 | 05001b0d | 00001c67 |
| 0564520 | 00000023 | 00001c67 | 00508723 | 000001eb | 00002aff | 00066f70 | 732e706c | 00000000 | 27f00078 | 000a1f60 | 25204728 | 00204790 |
| 0564600 | 001c47d0 | 34303410 | 002441e8 | 00002c07 | 24d00000 | 000a1264 | 0028344c | 33f441e8 | 0000001b | 40b40024 | 000a1c2c | 00242ecc |
| 0564660 | aa6caaf0 | 0001ac08 | 38940020 | 37f06e74 | aa6caaf0 | 0002ac08 | 3894001c | 37f06e74 | aa6caaf0 | 0003ac08 | 386c37f0 | 6e743d30 |
| 0564740 | 3cf4234c | 0007e68c | 29540044 | 0002438a | 2520450c | 00000018 | 04001c67 | 6b486b88 | 6bc86c08 | 45386c84 | 00185370 | 45684af8 |
| 0565020 | 00000023 | 6b7441e8 | 000031bf | 43000000 | 00002c0f | 0007f4ac | 000cc5a8 | 000a20c4 | 00000038 | b27cb66c | 00000038 | 0000004a |
| 0565100 | 000a20c8 | 02000ce5 | 05001b0d | 00001c67 | 0000002b | 00001c67 | 00508a23 | 000001eb | 00002aff | 2b242628 | 0002438a | 0009f16c |
| 0565160 | 27f00090 | 000a2078 | 25204728 | 00244790 | 002047f8 | 001c4848 | 00183430 | 34100028 | 42540000 | 00002c07 | 24d00000 | 000a1264 |
| 0565240 | 002c344c | 33f441e8 | 00000023 | 40b40028 | 000a1c2c | 00282ecc | aa6caaf0 | 0001ac08 | 38940024 | 37f06e74 | aa6caaf0 | 0002ac08 |
| 0565320 | 38940020 | 37f06e74 | aa6caaf0 | 0003ac08 | 3894001c | 37f06e74 | aa6caaf0 | 0004ac08 | 386c37f0 | 6e743d30 | 3cf4234c | 0007e68c |
| 0565400 | 29540048 | 0002438a | 2520450c | 0000001c | 05001c67 | 6b486b88 | 6bc86c08 | 6c480018 | 45386c84 | 001c5370 | 45684af8 | 0000002b |
| 0565460 | 6b7441e8 | 000031bf | 43000000 | 00002c0f | 0007f4ac | 000cc5a8 | 000a21f8 | 00000038 | b27cb66c | 00000039 | 0000004b | 000a21fc |
| 0565540 | 02000ce5 | 05001b0d | 00001c67 | 00000033 | 00001c67 | 00508d23 | 000001eb | 00002aff | 00096d79 | 72657665 | 72736500 | 27f000a4 |
| 0565620 | 000a21a8 | 25204728 | 00284790 | 002447f8 | 00204880 | 0018001c | 4848001c | 34303410 | 002c41e8 | 00002c07 | 24d00000 | 000a1264 |
| 0565700 | 0030344c | 33f441e8 | 0000002b | 40b4002c | 000a1c2c | 002c2ecc | aa6caaf0 | 0001ac08 | 38940028 | 37f06e74 | aa6caaf0 | 0002ac08 |
| 0565760 | 38940024 | 37f06e74 | aa6caaf0 | 0003ac08 | 38940020 | 37f06e74 | aa6caaf0 | 0004ac08 | 3894001c | 37f06e74 | aa6caaf0 | 0005ac08 |
| 0566040 | 386c37f0 | 6e743d30 | 3cf4234c | 0007e68c | 2954004c | 0002438a | 2520450c | 00000020 | 06001c67 | 6b486b88 | 6bc86c08 | 6c480018 |
| 0566120 | 6c48001c | 45386c84 | 00205370 | 45684af8 | 00000033 | 6b7441e8 | 000031bf | 43000000 | 00002c0f | 0007f4ac | 000cc5a8 | 000a2658 |
| 0566200 | 00000044 | b130b66c | 0000003a | 0000004c | 000a15c5 | 02000ce5 | 05001b0d | 00001c67 | 0000003b | 00001c67 | 00509023 | 000001eb |
| 0566260 | 00002aff | 000a2348 | 0000000c | 00000000 | 27f000bc | 000a22f4 | 25204728 | 002c4790 | 002847f8 | 00244880 | 00180020 | 4880001c |
| 0566340 | 001c4848 | 00203430 | 34100030 | 42540000 | 00002c07 | 24d00000 | 000a1264 | 0034344c | 33f441e8 | 00000033 | 40b40030 | 000a1c2c |
| 0566420 | 00302ecc | aa6caaf0 | 0001ac08 | 3894002c | 37f06e74 | aa6caaf0 | 0002ac08 | 38940028 | 37f06e74 | aa6caaf0 | 0003ac08 | 38940024 |
| 0566500 | 37f06e74 | aa6caaf0 | 0004ac08 | 38940020 | 37f06e74 | aa6caaf0 | 0005ac08 | 3894001c | 37f06e74 | aa6caaf0 | 0006ac08 | 386c37f0 |
| 0566560 | 6e743d30 | 3cf4234c | 0007e68c | 29540050 | 0002438a | 2520450c | 00000024 | 07001c67 | 6b486b88 | 6bc86c08 | 6c480018 | 6c48001c |
| 0566640 | 6c480020 | 45386c84 | 00245370 | 45684af8 | 0000003b | 6b7441e8 | 000031bf | 43000000 | 00002c0f | 0007f4ac | 000cc5a8 | 2aa80ec4 |
| 0566720 | 000aa9c8 | 0009f32a | 000e7472 | 616e736c | 6174655f | 626f6479 | 00000000 | 00097072 | 65747479 | 2e706c00 | 000a0fa0 | 02001b47 |
| 0567000 | 00002c07 | 00000008 | 000a2390 | 000a2390 | 00410000 | 00000000 | 2c780020 | 0002438a | 362c43c0 | 02000cdf | 4b8c0000 | 00002c07 |
| 0567060 | 6bc822bc | 000a0fb0 | 000a11f4 | 02001c67 | 00002c07 | 00000008 | 000a23d0 | 000a23d0 | 00410000 | 00000000 | 2c780020 | 0002438a |
| 0567140 | 362c43c0 | 02000cdf | 4b8c0000 | 00002c07 | 6bc822bc | 000a1024 | 000a23b0 | 03001c67 | 00002c07 | 0000000c | 000a2410 | 000a2410 |
| 0567220 | 00410000 | 00000000 | 2c780020 | 0002438a | 369043c0 | 02000cdf | 4b8c0000 | 00002c07 | 6c0822bc | 000a1084 | 000a23f0 | 04001c67 |
| 0567300 | 00002c07 | 00000010 | 000a2450 | 000a2450 | 00410000 | 00000000 | 2c780028 | 0002438a | 36f40018 | 447c0000 | 02000cdf | 4b8c0000 |
| 0567360 | 00002c07 | 6c480018 | 239c0000 | 000a10e4 | 000a2430 | 05001c67 | 00002c07 | 00000014 | 000a2498 | 000a2498 | 00410000 | 00000000 |
| 0567440 | 2c780028 | 0002438a | 36f4001c | 447c0000 | 02000cdf | 4b8c0000 | 00002c07 | 6c48001c | 239c0000 | 000a1144 | 000a2478 | 06001c67 |
| 0567520 | 00002c07 | 00000018 | 000a24e0 | 000a24e0 | 00410000 | 00000000 | 2c780028 | 0002438a | 36f40020 | 447c0000 | 02000cdf | 4b8c0000 |
| 0567600 | 00002c07 | 6c480020 | 239c0000 | 000a11a4 | 000a24c0 | 07001c67 | 00002c07 | 0000001c | 000a2528 | 000a2528 | 00410000 | 00000000 |
| 0567660 | 2c780028 | 0002438a | 36f40024 | 447c0000 | 02000cdf | 4b8c0000 | 00002c07 | 6c480024 | 239c0000 | 000a1204 | 000a1254 | 0400317f |

```
0567740  00002c07 00000010 000a0f10 000a0f10 00410000 00000000 0000002c 000bb750 b27cb66c 0000003e 7fffffff 0009d6c4
0570020  02000ce5 0200218d 00002c07 00001c67 00002aff 0000002c 000a25a4 b4f0b4e4 0000003d 7fffffff 0007f6c4 00000000
0570100  00000001 000a2578 0002438a 000a25c8 000a25cc 00002c07 b4640000 000a257c 000bf9b4 27f00000 0009f490 2ca025e8
0570160  0000001c 00000005 0009f0d8 0009f490 000a0ec0 000aaa28 00066170 722e706c 00000000 00087468 6561642e 706c0000
0570240  00086d79 61707065 6e640000 2b241ee0 0002438a 0009f1f0 00067072 65747479 000a263c 00066d79 72756c65 000a2648
0570320  00076361 6c6c2e70 6c002654 000a2748 00000058 b288b66c 0000005e 7fffffff 000a47c0 02000ce5 0100147d 01002d65
0570400  0000000b 00002aff 000a2748 0000002c b288b66c 0000005e 7fffffff 000a265c 02000ce5 0100147d 01002d65 0000000b
0570460  00002aff 002f2f68 6f6d652f 6f736173 312f612f 73726565 2f70726f 6c6f6724 74726961 6c732f64 6374672f 64637467
0570540  312f6170 72002c78 00322f68 6f6d652f 6f736173 312f612f 73726565 2f70726f 6c6f672d 74726961 6c732f64 6374672f
0570620  64637467 312f6170 722e706c 0020312c 0000002c 000a488c b27cb66c 00000060 7fffffff 0009eebc 02000ce5 0200293d
0570700  0000324f 000001fb 00002aff 000a2898 0000002c b288b65c 0000005f 7fffffff 000a2720 02000ce5 0100147d 01002d65
0570760  0000000b 00002aff 0000002c 000a48e4 b27cb66c 00000068 7fffffff 0009ef14 02000ce5 02001f6d 0000324f 00002c07
0571040  00002aff 2c7800bc 0002438a 5d100000 03003287 4b8c0000 00004327 60cc56f8 671c55f0 686855f0 69b05370 5818867b8
0571120  53705c30 020031f7 6530001c 5e540000 02003ff7 67ec0018 5a180000 02004327 66700020 5c9c001c 02000a3f 66c00024
0571200  001c5ec0 00000024 02000887 6b7458e0 02003ebf 6c840018 6c840020 5c9c001c 02000887 6d3c58e0 02003ff7 6c840018
0571260  6c344768 3410001c 24d00000 000d7e4c 0020344c 3eec001c 391831f0 24d00000 000d7e6c 0018386c 3d302340 000d72f4
0571340  0000003c 000a0cb0 b27cb66c 00009424 7fffffff 000a2904 02000ce5 020031ed 020031e5 0000432f 00000007 02003ff5
0571420  0000000c 00000007 00002aff 000a2a38 00000038 b27cb66c 00000425 0000043c 000a2a3c 02000ce5 05001b0d 0000432f
0571500  0000001b 00002c07 006beee3 0000029b 00002aff 2c780030 0002438a 5d100000 03003287 4b8c0000 0000432f 537055f0
0571560  671c5370 5d100000 02003ff7 5fa05370 4360228c 00000138 000a2860 b27cb66c 00000426 7fffffff 000a2c5c 02000ce5
0571640  020031ed 020031e5 00004307 02000a3d 0600374d 0000000c 00000010 00000014 00000018 0000001c 00000020 02003645
0571720  00000024 00000028 020031f5 01003ff5 02003535 0000002c 00000026 02000a3d 02000d0d 02000a65 02000d25 0000001a
0572000  000036ff 0200226d 00000030 02000a55 00000003 0000001e 0200226d 00000032 0000001e 02000a3d 020031fd 02003205
0572060  00000034 00000053 00000032 02000a3d 020031fd 02003205 00000038 00000053 00000016 02000a3d 02000d0d 02000a65
0572140  02000d25 0000003a 00000003 0200226d 0000003c 00000012 0200226d 0000003e 02000abd 00000012 0000003a 02000a3d
0572220  0200226d 00000040 02000a35 0000000e 0000003e 0200226d 0000002e 02000a05 00000042 00000036 00002aff 000a45f0
0572300  00000038 b130b66c 00000427 0000043d 0009dd29 02000ce5 05001b0d 00004307 0000001b 00002c07 006bdee3 0000029b
0572360  00002aff 27f001e8 000a2db8 5d100000 03003287 4b8c0000 00004307 64205818 67ec0020 55f06840 537056f8 671c5370
0572440  51100000 020031f7 64205c30 01003ff7 5a180000 02003537 67ec0028 69b05aec 02000a3f 64205c30 02000d0f 6530001c
0572520  5e540000 02000a67 65300018 5e540000 02000d27 67b84af8 000036ff 5c9c0018 0200226f 67ec0024 5a180000 02000a57
0572600  4b8c0000 00000003 67ec0018 5c9c001c 0200226f 6c840024 6c840018 5d100000 02000a3f 6580001c 5c9c001c 020031ff
0572660  67ec001c 6c840024 5c9c001c 02003207 67ec001c 4b8c0000 00000053 5d100000 02000a3f 65800024 5c9c0024 020031ff
0572740  66c00024 00305ec0 00000024 02003207 67ec0024 4b8c0000 00000053 5d100000 02000a3f 6580002c 5c9c002c 02000d0f
0573020  66c0002c 00345ec0 0000002c 02000a67 66c00038 002c5ec0 00000038 02000d27 6c840024 4b8c0000 00000003 5c9c002c
0573100  0200226f 66c00038 002c5ec0 00000034 0200226f 6c840038 5a180000 02000abf 6c84002c 6c840024 5d100000 02000a3f
0573160  61100034 5d100000 0200226f 67ec0024 5a180000 02000a37 671c6c84 00385ec0 00000034 0200226f 6c840028 5a180000
0573240  02000a07 6c840024 6c84001c 370c0024 477c3500 00283260 001c3678 00303614 002c247c 000d7f14 001c3964 00183d9c
0573320  3858320c 24200000 000cc5cc 00000164 000a2904 b27cb66c 00000428 7fffffff 000a2fe0 02000ce5 020031ed 020031e5
0573400  00004307 02000a3d 07003745 0000000c 00000010 00000014 00000018 0000001c 00000020 00000024 02003645 00000028
0573460  0000002c 020031f5 01003ff5 02003535 00000030 0000002a 02000a3d 02000d0d 02000a65 02000d25 0000001e 000036ff
0573540  0200226d 00000034 02000a55 00000003 00000022 0200226d 00000036 00000022 02000a3d 020031fd 02003205 00000038
0573620  00000053 00000036 02000a3d 020031fd 02003205 0000003c 0000000e 0000001a 02000a3d 03003bdd 0000000e 00000012
0573700  00000040 02000a3d 03003bdd 0000000e 00000016 00000044 02000a3d 02000d0d 02000a65 02000d25 0000003e 00000003
0573760  0200226d 00000048 00000046 0200226d 0000004a 02000abd 00000046 0000003e 02000a3d 0200226d 0000004c 02000a35
0574040  00000042 0000004a 0200226d 00000032 02000a05 0000004e 0000003a 00002aff 28c40220 000a30f8 5d100000 03003287
0574120  4b8c0000 00004307 64205818 67ec0024 55f06840 537056f8 671c5370 5d100000 020031f7 64205c30 01003ff7 5a180000
0574200  02003537 67ec002c 69b05aec 02000a3f 64205c30 02000d0f 66700018 5c9c0018 02000a67 66c00018 001c5ec0 00000018
0574260  02000d27 67ec0018 4b8c0000 000036ff 5c9c001c 0200226f 67ec0020 5a180000 02000a57 4b8c0000 00000003 67ec001c
0574340  5e540000 0200226f 6c840020 6c84001c 5d100000 02000a3f 64205c30 020031ff 67b86c84 00205c30 02003207 67ec0020
0574420  4b8c0000 00000053 5d100000 02000a3f 61100028 5d100000 020031ff 60cc5aec 02003207 65800038 5c9c0028 02000a3f
0574500  66c00030 00285ec0 00000030 03003bdf 6b7466c0 00300040 5c9c0028 02000a3f 66c00034 00285ec0 00000034 03003bdf
0574560  6b7466c0 00340044 5c9c0028 02000a3f 66c0003c 00285ec0 0000003c 02000d0f 66c0003c 00485ec0 0000003c 02000a67
0574640  66c0004c 003c5ec0 0000004c 02000d27 6c840038 4b8c0000 00000003 5c9c003c 0200226f 67ec003c 6c840044 5c9c0048
0574720  0200226f 6c84003c 5a180000 02000abf 6c840044 6c840038 5c9c0028 02000a3f 66c00028 00385ec0 00000028 0200226f
0575000  67ec0028 5a180000 02000a37 6c840040 6c84003c 5c9c0038 0200226f 6c84002c 5a180000 02000a07 6c840028 6c840020
```

| | | | | | | | | | | | | |
|---|---|---|---|---|---|---|---|---|---|---|---|---|
| 0575060 | 370c0028 | 477c3500 | 002c3260 | 00203678 | 00343614 | 0030247c | 000d7f68 | 001c3968 | 00183d9c | 3858320c | 24200000 | 000cc5cc |
| 0575140 | 00000120 | 000a2c5c | b27cb66c | 00000429 | 7fffffff | 000a32c8 | 02000ce5 | 020031ed | 020031e5 | 00004307 | 0600374d | 0000000c |
| 0575220 | 00000010 | 00000014 | 00000018 | 0000001c | 00000020 | 020031f5 | 01003ff5 | 00000024 | 02000a3d | 02000d0d | 02000a65 | 02000d25 |
| 0575300 | 0000001a | 000036ff | 0200226d | 00000028 | 02000a55 | 00000003 | 0000001e | 0200226d | 0000002a | 0000001e | 02000a3d | 020031fd |
| 0575360 | 02003205 | 0000002c | 00000053 | 0000002a | 02000a3d | 020031fd | 02003205 | 00000030 | 00000053 | 00000016 | 02000a3d | 02000d0d |
| 0575440 | 02000a65 | 02000d25 | 00000032 | 00000003 | 0200226d | 00000034 | 00000012 | 0200226d | 00000036 | 02000abd | 00000012 | 00000032 |
| 0575520 | 02000a3d | 0200226d | 00000038 | 02000a35 | 0000000e | 00000036 | 0200226d | 00000026 | 02000a05 | 0000003a | 0000002e | 00002aff |
| 0575600 | 28c401c8 | 000a340c | 5d100000 | 03003287 | 4b8c0000 | 00004307 | 64205818 | 67ec0020 | 537056f8 | 671c5370 | 5d100000 | 020031f7 |
| 0575660 | 64205c30 | 01003ff7 | 67ec0028 | 5d100000 | 02000a3f | 64205c30 | 02000d0f | 6530001c | 5e540000 | 02000a67 | 65300018 | 5e540000 |
| 0575740 | 02000d27 | 67b84af8 | 000036ff | 5c9c0018 | 0200226f | 67ec0024 | 5a180000 | 02000a57 | 4b8c0000 | 00000003 | 67ec0018 | 5c9c001c |
| 0576020 | 0200226f | 6c840024 | 6c840018 | 5d100000 | 02000a3f | 6580001c | 5c9c001c | 020031ff | 67ec001c | 6c840024 | 5c9c001c | 02003207 |
| 0576100 | 67ec001c | 4b8c0000 | 00000053 | 5d100000 | 02000a3f | 65800024 | 5c9c0024 | 020031ff | 66c00024 | 00305ec0 | 00000024 | 02003207 |
| 0576160 | 67ec0024 | 4b8c0000 | 00000053 | 5d100000 | 02000a3f | 6580002c | 5c9c002c | 02000d0f | 66c0002c | 00345ec0 | 0000002c | 02000a67 |
| 0576240 | 66c00038 | 002c5ec0 | 00000038 | 02000d27 | 6c840024 | 4b8c0000 | 00000003 | 5c9c002c | 0200226f | 66c00038 | 002c5ec0 | 00000034 |
| 0576320 | 0200226f | 6c840038 | 5a180000 | 02000abf | 6c84002c | 6c840024 | 5d100000 | 02000a3f | 61100034 | 5d100000 | 0200226f | 67ec0024 |
| 0576400 | 5a180000 | 02000a37 | 671c6c84 | 00385ec0 | 00000034 | 0200226f | 6c840028 | 5a180000 | 02000a07 | 6c840024 | 6c84001c | 370c0024 |
| 0576460 | 37240028 | 3260001c | 36780030 | 3614002c | 239c0000 | 000d7f14 | 0000014c | 000a2fe0 | b27cb66c | 0000042a | 7fffffff | 000a3614 |
| 0576540 | 02000ce5 | 020031ed | 020031e5 | 00004307 | 07003745 | 0000000c | 00000010 | 00000014 | 00000018 | 0000001c | 00000020 | 00000024 |
| 0576620 | 020031f5 | 01003ff5 | 00000028 | 02000a3d | 02000d0d | 02000a65 | 02000d25 | 0000001e | 000036ff | 0200226d | 0000002c | 02000a55 |
| 0576700 | 00000003 | 00000022 | 0200226d | 0000002e | 00000022 | 02000a3d | 020031fd | 02003205 | 00000030 | 00000053 | 0000002e | 02000a3d |
| 0576760 | 020031fd | 02003205 | 00000034 | 0000000e | 0000001a | 02000a3d | 03003bdd | 0000000e | 00000012 | 00000038 | 02000a3d | 03003bdd |
| 0577040 | 0000000e | 00000016 | 0000003c | 02000a3d | 02000d0d | 02000a65 | 02000d25 | 00000036 | 00000003 | 0200226d | 00000040 | 0000003e |
| 0577120 | 0200226d | 00000042 | 02000abd | 0000003e | 00000036 | 02000a3d | 0200226d | 00000044 | 02000a35 | 0000003a | 00000042 | 0200226d |
| 0577200 | 0000002a | 02000a05 | 00000046 | 00000032 | 00002aff | 28c40200 | 000a36b0 | 5d100000 | 03003287 | 4b8c0000 | 00004307 | 64205818 |
| 0577260 | 67ec0024 | 537056f8 | 671c5370 | 5d100000 | 020031f7 | 64205c30 | 01003ff7 | 67ec002c | 5d100000 | 02000a3f | 64205c30 | 02000d0f |
| 0577340 | 66700018 | 5c9c0018 | 02000a67 | 66c00018 | 001c5ec0 | 00000018 | 02000d27 | 67ec0018 | 4b8c0000 | 000036ff | 5c9c001c | 0200226f |
| 0577420 | 67ec0020 | 5a180000 | 02000a57 | 4b8c0000 | 00000003 | 67ec001c | 5e540000 | 0200226f | 6c840020 | 6c84001c | 5d100000 | 02000a3f |
| 0577500 | 64205c30 | 020031ff | 67b86c84 | 00205c30 | 02003207 | 67ec0020 | 4b8c0000 | 00000053 | 5d100000 | 02000a3f | 61100028 | 5d100000 |
| 0577560 | 020031ff | 60cc5aec | 02003207 | 65800038 | 5c9c0028 | 02000a3f | 66c00030 | 00285ec0 | 00000030 | 03003bdf | 6b7466c0 | 00300040 |
| 0577640 | 5c9c0028 | 02000a3f | 66c00034 | 00285ec0 | 00000034 | 03003bdf | 6b7466c0 | 00340044 | 5c9c0028 | 02000a3f | 66c0003c | 00285ec0 |
| 0577720 | 0000003c | 02000d0f | 66c0003c | 00485ec0 | 0000003c | 02000a67 | 66c0004c | 003c5ec0 | 0000004c | 02000d27 | 6c840038 | 4b8c0000 |
| 0600000 | 00000003 | 5c9c003c | 0200226f | 67ec003c | 6c840044 | 5c9c0048 | 0200226f | 6c84003c | 5a180000 | 02000abf | 6c840044 | 6c840038 |
| 0600060 | 5c9c0028 | 02000a3f | 66c00028 | 00385ec0 | 00000028 | 0200226f | 67ec0028 | 5a180000 | 02000a37 | 6c840040 | 6c84003c | 5c9c0038 |
| 0600140 | 0200226f | 6c84002c | 5a180000 | 02000a07 | 6c840028 | 6c840020 | 370c0028 | 3724002c | 32600020 | 36780034 | 36140030 | 239c0000 |
| 0600220 | 000d7f68 | 000000a4 | 000a32c8 | b27cb66c | 0000042b | 7fffffff | 000a37b0 | 02000ce5 | 020031ed | 020031e5 | 00004307 | 0300380d |
| 0600300 | 0000000c | 00000010 | 00000014 | 020031f5 | 01003ff5 | 00000018 | 02000d0d | 02000a65 | 02000d25 | 0000000e | 00000013 | 02003c05 |
| 0600360 | 00000012 | 0000001a | 02000d0d | 02000a65 | 02000d25 | 0000000e | 00000043 | 02003c0d | 00000012 | 0000001a | 02000a65 | 02000d25 |
| 0600440 | 0000000e | 00000083 | 02003c1d | 00000012 | 0000001a | 00002aff | 28c400f8 | 000a37ec | 5d100000 | 03003287 | 4b8c0000 | 00004307 |
| 0600520 | 64205818 | 67b85370 | 56f8671c | 53705aec | 020031f7 | 65800018 | 5c9c0018 | 01003ff7 | 67ec0018 | 5d100000 | 02000d0f | 6110001c |
| 0600600 | 5d100000 | 02000a67 | 61100020 | 5d100000 | 02000d27 | 671c4af8 | 00000013 | 5c9c0020 | 02003c07 | 67ec0020 | 6c840018 | 5c9c001c |
| 0600660 | 02000d0f | 66c00024 | 001c5ec0 | 00000024 | 02000a67 | 66c00028 | 00245ec0 | 00000028 | 02000d27 | 6b744af8 | 00000043 | 5c9c0024 |
| 0600740 | 02003c0f | 6c840020 | 6c840018 | 5c9c001c | 02000a67 | 66c00024 | 001c5ec0 | 00000024 | 02000d27 | 6b744af8 | 00000083 | 5c9c001c |
| 0601020 | 02003c1f | 6c840020 | 6c840018 | 370c0018 | 3724001c | 32283614 | 002022bc | 000d7fe0 | 00000044 | 000a3614 | b27cb66c | 0000042c |
| 0601100 | 7fffffff | 000a3840 | 02000ce5 | 020031ed | 020031e5 | 00004307 | 02003765 | 0000000c | 00000010 | 01003ff5 | 01003ce5 | 0000000e |
| 0601160 | 00002aff | 28c4004c | 000a387c | 5d100000 | 03003287 | 4b8c0000 | 00004307 | 64205818 | 67ec001c | 537056f8 | 671c5370 | 5d100000 |
| 0601240 | 01003ff7 | 5a180000 | 01003ce7 | 671c36a4 | 37240018 | 3678001c | 320c22bc | 000cf1c8 | 00000044 | 000a37b0 | b27cb66c | 0000042d |
| 0601320 | 7fffffff | 000aec64 | 02000ce5 | 020031ed | 020031e5 | 00004307 | 02003755 | 0000000c | 00000010 | 01003ff5 | 0100433d | 0000000e |
| 0601400 | 00002aff | 2954004c | 0002438a | 5d100000 | 03003287 | 4b8c0000 | 00004307 | 64205818 | 67ec001c | 537056f8 | 671c5370 | 5d100000 |
| 0601460 | 01003ff7 | 5a180000 | 0100433f | 671c36a4 | 37240018 | 3678001c | 320c22bc | 000d803c | 28c40150 | 000a3ab0 | 5d100000 | 03003287 |
| 0601540 | 4b8c0000 | 00004367 | 60cc56f8 | 671c55f0 | 697c001c | 55f06a00 | 53705818 | 6530001c | 5e540000 | 020031f7 | 65300020 | 5e540000 |
| 0601620 | 02003ebf | 67ec0019 | 5a180000 | 02003ac7 | 69b058e0 | 02004367 | 4b8c0000 | 00001ee7 | 67b85ec0 | 00000020 | 02000a3f | 66c00024 |
| 0601700 | 00205ec0 | 00000024 | 02000887 | 6e58001c | 5a180000 | 02003ebf | 6c840018 | 6c345ec0 | 00000020 | 02000cdf | 6c840018 | 5a180000 |
| 0601760 | 01001b87 | 5a180000 | 02003ac7 | 6d3c58e0 | 02004367 | 4b8c0000 | 00001ee7 | 6c345878 | 001c67ec | 001c5370 | 5c9c001c | 020031f7 |
| 0602040 | 66c00020 | 001c5ec0 | 00000020 | 02004377 | 6c840018 | 5a180000 | 02003ac7 | 6d3c58e0 | 02004367 | 4b8c0000 | 00001ee7 | 6c345ec0 |
| 0602120 | 0000001c | 02000887 | 6e58001c | 5a180000 | 02003ebf | 6c840018 | 6c3436a4 | 477c3540 | 00180020 | 362c37dc | 43000000 | 00001ee7 |

```
0602200  000cc5cc 002433d8 3e700020 3af4001c 000da3f4 001c38e8 316c2330 c00cc8c0 00000098 000b095c b27cb66c 00000452
0602260  7fffffff 000a3b8c 02000ce5 020031ed 020031e5 00004367 02000a3d 02003645 0000348f 0000000c 010040b5 00000010
0602340  02000a3d 020031f5 02003ebd 00000014 02003ac5 0000000e 01004365 0000348f 02000cdd 00000016 01001b85 02003ac5
0602420  0000000e 01004365 0000348f 02004375 00000016 02003ac5 0000000e 01004365 0000348f 00002aff 28c400d4 000a3d58
0602500  5d100000 03003287 4b8c0000 00004367 64205818 67ec001c 55f0682c 537056f8 61100018 5d100000 020031f7 61100020
0602560  5d100000 02003ebf 67b858e0 02003ac7 671c58e0 01004367 4b8c0000 0000348f 5c9c0020 02000cdf 6c3458e0 01001b87
0602640  5a180000 02003ac7 6b7458e0 01004367 4b8c0000 0000348f 58780018 67ec0018 53705ec0 00000018 02004377 6c3458e0
0602720  02003ac7 6b7458e0 01004367 4b8c0000 0000348f 36a44768 34e00018 3678001c 35c842ac 0000348f 000cc5cc 00183848
0603000  316037dc 31f0234c 000cf990 000001d4 000a3a20 b27cb66c 00000453 7fffffff 000a40a0 02000ce5 020031ed 020031e5
0603060  00004367 02000a3d 02003645 0000000c 00000010 02000a3d 010036d5 00000014 02000a3d 02000885 00004177 00000018
0603140  02000a3d 010036dd 0000001c 010040b5 00000020 02000a3d 020031f5 02003eb4 00000024 02003d35 0000000e 00000028
0603220  02000d0d 02000a65 02003ba5 00000026 0000000e 02000a3d 00002aff 02000a3d 02000885 0000001a 02003ff5 00000026
0603300  0000002a 02000a3d 02000cdd 00000026 01001b85 02003ac5 00000012 02003d35 0000000e 0000002a 02000cdd 00003d2f
0603360  01001b85 04003d35 00000026 0000000e 0000002a 00000012 02000a3d 01002ced 0000417f 02000a3d 01002ced 0000000e
0603440  02000a3d 01002ced 00003ad7 02000a3d 01002ced 00000012 00002527 020031f5 02004375 00000026 02003d35 0000000e
0603520  0000002a 02000d0d 02000a65 02003ba5 00000026 0000000e 02000a3d 00002aff 02000a3d 02000885 0000001a 02003ff5
0603600  00000026 0000002a 02000cdd 00003d2f 01001b85 04003d35 00000026 0000000e 0000002a 00000012 02000a3d 01002ced
0603660  0000417f 02000a3d 01002ced 0000000e 02000a3d 01002ced 00003ad7 02000a3d 01002ced 00000012 00002527 00002aff
0603740  28c40340 000a4214 5d100000 03003287 4b8c0000 00004367 64205818 67ec0020 55f0687c 002855f0 6af00020 55f06aa0
0604020  55f069b0 537056f8 60cc5aec 020031f7 6110001c 5d100000 02003ebf 67ec0024 5a180000 02003d37 61100018 5c9c001c
0604100  02000d0f 66c0001c 00285ec0 0000001c 02000a67 66c0002c 001c5ec0 0000002c 02003ba7 6c840024 6b745ec0 0000001c
0604160  02000a3f 4b8c0000 00002aff 5a180000 02000a3f 66c0002c 001c5ec0 0000002c 02000887 6e580020 5a180000 02003ff7
0604240  6c840024 6c840018 5c9c001c 02000a3f 66c0001c 002c5ec0 0000001c 02000cdf 6c840024 5a180000 01001b87 5a180000
0604320  02003ac7 67ec001c 5a180000 02003d37 6b746c84 00185ec0 0000002c 02000cdf 4b8c0000 00003d2f 5a180000 01001b87
0604400  5a180000 04003d37 6c840024 6b746c84 00186c84 001c5ec0 00000028 02000a3f 66c0002c 00285ec0 0000002c 01002cef
0604460  4b8c0000 0000417f 5c9c0028 02000a3f 66c0002c 00285ec0 0000002c 01002cef 6b745ec0 00000020 02000a3f 66c0002c
0604540  00285ec0 0000002c 01002cef 4b8c0000 00003ad7 5c9c0028 02000a3f 67ec0028 4b8c0000 00002527 5c9c0028 01002cef
0604620  6c84001c 581867b8 53705c30 020031f7 66700028 5c9c0028 02004377 6c840024 5a180000 02003d37 6b746c84 00185c30
0604700  02000d0f 66700028 5c9c0028 02000a67 66c0002c 00285ec0 0000002c 02003ba7 6c840024 6b745ec0 00000028 02000a3f
0604760  4b8c0000 00002aff 5a180000 02000a3f 66c0002c 00285ec0 0000002c 02000887 6e580020 5a180000 02003ff7 6c840024
0605040  6c840018 5c9c0028 02000cdf 4b8c0000 00003d2f 5a180000 01001b87 5a180000 04003d37 6c840024 6b746c84 00186c84
0605120  001c5c30 02000a3f 66700018 5c9c0018 01002cef 4b8c0000 0000417f 5e540000 02000a3f 66700018 5c9c0018 01002cef
0605200  6b745c30 02000a3f 66700018 5c9c0018 01002cef 4b8c0000 00003ad7 5e540000 02000a3f 67b84af8 00002527 5e540000
0605260  01002cef 6c84001c 36a44768 35400018 002c3678 00203614 001c247c 000cc5cc 003034a0 00243eec 002c382c 002831f0
0605340  24d00000 000cf098 00283410 001c3e70 00243c9c 00000020 00d0590 0020344c 3eec001c 381831f0 24400000 000cf0d8
0605420  001838d4 316037dc 31f0234c 000cf990 0000017c 000a3b8c b27cb66c 00000454 7fffffff 000a4a6c 02000ce5 020031ed
0605500  020031e5 00004367 02000a3d 02003645 0000000c 00000010 010040b5 00000014 02000a3d 020031f5 02003ebd 00000018
0605560  02003d35 0000000e 00000007 02000d0d 02000a65 02003ba5 0000001a 0000000e 02000a3d 00002aff 02000a3d 02000cdd
0605640  0000001a 01001b85 02003ac5 00000012 02003d35 0000000e 00000007 02000cdd 00003d2f 01001b85 04003d35 0000001a
0605720  0000000e 00000007 00000012 02000a3d 01002ced 0000417f 02000a3d 01002ced 0000000e 02000a3d 01002ced 00003ad7
0606000  02000a3d 01002ced 00000012 00002527 020031f5 02004375 0000001a 02003d35 0000000e 00000007 02000d0d 02000a65
0606060  02003ba5 0000001a 0000000e 02000a3d 00002aff 02000cdd 00003d2f 01001b85 04003d35 0000001a 0000000e 00000007
0606140  00000012 02000a3d 01002ced 0000417f 02000a3d 01002ced 0000000e 02000a3d 01002ced 00003ad7 02000a3d 01002ced
0606220  00000012 00002527 00002aff 28c40290 000a4d00 5d100000 03003287 4b8c0000 00004367 64205818 67ec0020 55f0682c
0606300  537056f8 60cc5aec 020031f7 6110001c 5d100000 02003ebf 67ec0018 5a180000 02003d37 671c5370 5c9c001c 02000d0f
0606360  66c0001c 00245ec0 0000001c 02000a67 66c00028 001c5ec0 00000028 02003ba7 6c840018 6b745ec0 0000001c 02000a3f
0606440  4b8c0000 00002aff 5a180000 02000a3f 66c0001c 00285ec0 0000001c 02000cdf 6c840018 5a180000 01001b87 5a180000
0606520  02003ac7 67ec001c 5a180000 02003d37 6b745370 5c9c0028 02000cdf 4b8c0000 00003d2f 5a180000 01001b87 5a180000
0606600  04003d37 6c840018 6b745370 6c84001c 5c9c0024 02000a3f 66c00028 00245ec0 00000028 01002cef 4b8c0000 0000417f
0606660  5c9c0024 02000a3f 66c00028 00245ec0 00000028 01002cef 6b745ec0 00000024 02000a3f 66c00028 00245ec0 00000028
0606740  01002cef 4b8c0000 00003ad7 5c9c0024 02000a3f 67ec0024 4b8c0000 00002527 5c9c0024 01002cef 6c84001c 581867b8
0607020  53705c30 020031f7 66700024 5c9c0024 02004377 6c840018 5a180000 02003d37 6b745370 5e540000 02000d0f 66700024
0607100  5c9c0024 02000a67 66c00028 00245ec0 00000028 02003ba7 6c840018 6b745ec0 00000024 02000a3f 4b8c0000 00002aff
0607160  5a180000 02000cdf 4b8c0000 00003d2f 5a180000 01001b87 5a180000 04003d37 6c840018 6b745370 6c84001c 5e540000
0607240  02000a3f 66700018 5c9c0018 01002cef 4b8c0000 0000417f 5e540000 02000a3f 66700018 5c9c0018 01002cef 6b745c30
```

| | | | | | | | | | | | | |
|---|---|---|---|---|---|---|---|---|---|---|---|---|
| 0607320 | 02000a3f | 66700018 | 5c9c0018 | 01002cef | 4b8c0000 | 00003ad7 | 5e540000 | 02000a3f | 67b84af8 | 00002527 | 5e540000 | 01002cef |
| 0607400 | 6c84001c | 36a44768 | 34e00018 | 36780020 | 3614001c | 24d00000 | 000cc5cc | 001838d4 | 3d6037dc | 31f0234c | 000cf990 | 0035203a |
| 0607460 | 206e6f74 | 20612076 | 61726961 | 626c6520 | 696e2074 | 68652076 | 61726961 | 626c6520 | 61737369 | 676e6d65 | 6e74206f | 6e206c69 |
| 0607540 | 6e652000 | 29540084 | 0002438a | 5d100000 | 03003287 | 4b8c0000 | 000043a7 | 60cc56f8 | 671c55f0 | 682c5370 | 581867b8 | 53705c30 |
| 0607620 | 020031f7 | 6530001c | 5e540000 | 02003ebf | 67ec0018 | 5a180000 | 01003567 | 67b85ec0 | 0000001c | 02000887 | 6d3c58e0 | 02003ebf |
| 0607700 | 6c840018 | 6c3436a4 | 476834e0 | 0018362c | 320c42ac | 00003567 | 000cc5cc | 0018386c | 3d302340 | 000da24c | 0000008c | 000a66f0 |
| 0607760 | b27cb66c | 0000046c | 7fffffff | 000a4910 | 02000ce5 | 020031ed | 020031e5 | 0000441f | 02000a3d | 02003645 | 0000000c | 00000010 |
| 0610040 | 02000a3d | 02003645 | 00002197 | 00000014 | 02000885 | 00004427 | 00000018 | 020031f5 | 02003ff5 | 0000001c | 00000001 | 0000000e |
| 0610120 | 00000001 | 00000020 | 00000007 | 02000885 | 0000001a | 02004005 | 0000001e | 00000022 | 00002aff | 000a47c4 | 00000070 | b27cb66c |
| 0610200 | 0000046d | 000004b6 | 000b0ae4 | 02000ce5 | 05001b0d | 0000441f | 0000001b | 00002c07 | 006d2ee3 | 000002a3 | 00002aff | 000a47c4 |
| 0610260 | 00000038 | 03002c3f | 00000ce7 | 00002583 | 0000203f | 02000ce7 | 000a462d | 00002aff | 02000ce7 | 000a4655 | 00002aff | 03002c3f |
| 0610340 | 00000ce7 | 0003706f | 7700eebc | 00026265 | 0000004e | 00003207 | b328e924 | 000c52bc | 00000000 | 00093d44 | 00000000 | 000a466c |
| 0610420 | 000a467c | 000a68b8 | 0000324f | b3281d57 | 000a2724 | 00000000 | ffffffff | 06003217 | 00002c07 | 00000018 | 000a892c | 000a4a14 |
| 0610500 | 00010040 | 00000000 | 2cac46c0 | 0002438a | 2ca03157 | 00000004 | 00000002 | 0009f0fc | 0009f1e0 | 0002438a | 000a46e9 | 000b7838 |
| 0610560 | 000a4760 | 000a4750 | ffffffff | 0600321f | 00002c07 | 00000018 | 000a25dc | 0009f490 | 00010041 | 00000000 | ffffffff | 02003227 |
| 0610640 | 00002c07 | 00000008 | 000a4784 | 000a4784 | 0001003f | 00000000 | ffffffff | 0200322f | 00002c07 | 00000008 | 000acab8 | 000acaec |
| 0610720 | 00010042 | 00000000 | 020031ef | 29c81d57 | 000a1fdc | 0009f10c | 020031e7 | 29c8001f | 000a2624 | 0009f140 | 29540014 | 0002438a |
| 0611000 | 56f876b0 | 239c0000 | 000a6800 | 2c780014 | 0002438a | 36404368 | 239c0000 | 000a687c | 0009f45c | 000aaa10 | 00036c65 | 7800cbe8 |
| 0611060 | 00057468 | 65616400 | 00057661 | 6c756500 | 00036170 | 7200265c | 000a48b4 | 00000058 | b288b66c | 0000006c | 7fffffff | 000a690c |
| 0611140 | 02000ce5 | 0100147d | 01002d65 | 0000000b | 00002aff | 000a48b4 | 0000002c | b288b66c | 0000006c | 7fffffff | 000a47c8 | 02000ce5 |
| 0611220 | 0100147d | 01002d65 | 0000000b | 00002aff | 00312f68 | 6f6d652f | 6f736173 | 312f612f | 73726565 | 2f70726f | 6c6f672d | 74726961 |
| 0611300 | 6c732f64 | 6374672f | 64637467 | 312f7468 | 65616400 | 00342f68 | 6f6d652f | 6f736173 | 312f612f | 73726565 | 2f70726f | 6c6f672d |
| 0611360 | 74726961 | 6c732f64 | 6374672f | 64637467 | 312f7468 | 6561642e | 706c0007 | 0000002c | 0009edf8 | b27cb66c | 0000006e | 7fffffff |
| 0611440 | 000a2720 | 02000ce5 | 0200293d | 0000327f | 00000203 | 00002aff | 000a5918 | 0000002c | b288b66c | 0000006d | 7fffffff | 000a488c |
| 0611520 | 02000ce5 | 0100147d | 01002d65 | 0000000b | 00002aff | 0000002c | 0009f0a0 | b27cb66c | 00000074 | 7fffffff | 000a2778 | 02000ce5 |
| 0611600 | 02001f6d | 0000327f | 00002c07 | 00002aff | 000000a4 | 000a4568 | b27cb66c | 0000046e | 7fffffff | 000a6a94 | 02000ce5 | 020031ed |
| 0611660 | 020031e5 | 000043c7 | 02000a3d | 02003645 | 000034e7 | 0000000c | 02000a3d | 0000083f | 02000a3d | 02000885 | 00003b3f | 00000010 |
| 0611740 | 02000885 | 0000442f | 00000014 | 020031f5 | 02003ebd | 00000018 | 020034e5 | 0000001c | 00000020 | 02000a3d | 02000885 | 00000012 |
| 0612020 | 02003ff5 | 0000001a | 0000001e | 02000885 | 00000016 | 02003ebd | 0000001a | 00000022 | 00002aff | 29380068 | 000a4a14 | 5d100000 |
| 0612100 | 02000a3f | 682c671c | 4728001c | 47543600 | 48800018 | 00244880 | 001c0020 | 33d8247c | 000a6800 | 00281164 | 3af40024 | 000a891c |
| 0612160 | 00243894 | 0020442c | 03003287 | 6d3c6e1c | 001c6dd8 | 45506d94 | 53704538 | 6d506bb4 | 45506c34 | 6b742340 | 000a17fc | 29540050 |
| 0612240 | 0002438a | 45b84728 | 001c4754 | 47d035b0 | 00184880 | 001c0020 | 3364247c | 000a891c | 00243894 | 0020442c | 03003287 | 6d0c6e1c |
| 0612320 | 001c6dd8 | 45506d94 | 53704538 | 6d506bb4 | 45506c34 | 6b742340 | 000a17fc | 0000029c | 000a40a0 | b27cb66c | 00000455 | 7fffffff |
| 0612400 | 000a51b0 | 02000ce5 | 020031ed | 020031e5 | 00004367 | 02000a3d | 02000885 | 000043d7 | 0000000c | 02000a3d | 0100168d | 00000010 |
| 0612460 | 02000a3d | 02000885 | 00003b3f | 00000014 | 0100371d | 00000012 | 02000a3d | 020031f5 | 02003ebd | 00000018 | 02003ac5 | 00000012 |
| 0612540 | 03004365 | 000043df | 0000001c | 00000020 | 02000a3d | 02000885 | 0000000e | 0200412d | 0000001a | 0000001e | 02000a3d | 0000083f |
| 0612620 | 02000a3d | 02000d0d | 02000d25 | 0000001e | 02003ca5 | 00000024 | 00000028 | 02000d0d | 02000d25 | 0000001e | 02003cb5 | 00000026 |
| 0612700 | 0000002c | 02000d0d | 02000d25 | 0000001e | 030043e5 | 00000026 | 00000030 | 00000034 | 02000d25 | 00000026 | 0000001e | 02000a3d |
| 0612760 | 02000d0d | 02003bd5 | 02003ac5 | 00000038 | 01003ae5 | 0000003c | 00000040 | 0000001a | 02000a3d | 01002ced | 00000026 |
| 0613040 | 02000a3d | 01002ced | 000043ef | 02000a3d | 01002ced | 00000012 | 00002527 | 02000a3d | 0000083f | 02000a3d | 02000885 | 00000016 |
| 0613120 | 02003ff5 | 0000001a | 00000022 | 02000cdd | 0000001a | 01001b85 | 02003ac5 | 00000012 | 03004365 | 000043df | 0000001e | 00000022 |
| 0613200 | 020031f5 | 02004375 | 0000001a | 02003ac5 | 00000012 | 03004365 | 000043df | 0000001e | 00000022 | 02000a3d | 02000885 | 0000000e |
| 0613260 | 0200412d | 0000001a | 0000001e | 02000a3d | 02000d0d | 02000d25 | 0000001e | 02003ca5 | 00000026 | 00000044 | 02000d0d | 02000d25 |
| 0613340 | 0000001e | 02003cb5 | 00000026 | 00000048 | 02000d0d | 02000d25 | 0000001e | 030043e5 | 00000026 | 0000004c | 00000050 | 02000d25 |
| 0613420 | 00000026 | 0000001e | 02000a3d | 02000d0d | 02003bd5 | 02003ac5 | 00000054 | 03003ae5 | 00000026 | 00000058 | 0000005c | 0000001a |
| 0613500 | 02000a3d | 01002ced | 0000001e | 02000a3d | 01002ced | 000043ef | 02000a3d | 01002ced | 00000012 | 00002527 | 02000a3d | 0000083f |
| 0613560 | 02000885 | 00000016 | 02003ff5 | 0000001a | 00000022 | 00002aff | 28c40474 | 000a5444 | 5d100000 | 03003287 | 4b8c0000 | 00004367 |
| 0613640 | 60cc56f8 | 671c55f0 | 687c0024 | 55f06af0 | 001c55f0 | 6a005370 | 58186530 | 001c5c30 | 020031f7 | 65300020 | 5e540000 | 02003ebf |
| 0613720 | 67ec0018 | 5a180000 | 02003ac7 | 69b058e0 | 03004367 | 4b8c0000 | 000043df | 66700024 | 5c9c0020 | 02000a3f | 66c00028 | 00205ec0 |
| 0614000 | 00000028 | 02000887 | 6b7458e0 | 0200412f | 6c840018 | 6c840024 | 5c9c0020 | 02000a3f | 4b8c0000 | 0000083f | 5a180000 | 02000a3f |
| 0614060 | 66c00028 | 00205ec0 | 00000029 | 02000d0f | 66c00028 | 002c5ec0 | 00000028 | 02000d27 | 6c840024 | 5a180000 | 02003ca7 | 67ec0028 |
| 0614140 | 5fa05ec0 | 0000002c | 02000d0f | 66c00030 | 002c5ec0 | 00000030 | 02000d27 | 6c840024 | 5a180000 | 02003cb7 | 6c840028 | 5fa05ec0 |
| 0614220 | 0000002c | 02000d0f | 66c00030 | 002c5ec0 | 00000030 | 02000d27 | 6c840024 | 5a180000 | 030043e7 | 6c840028 | 5f8c5ec0 | 0000002c |
| 0614300 | 02000d27 | 6c840028 | 6c840024 | 5c9c0020 | 02000a3f | 66c0002c | 00205ec0 | 0000002c | 02000d0f | 66c00030 | 002c5ec0 | 00000030 |
| 0614360 | 02003bd7 | 67ec0030 | 6c840018 | 5c9c0030 | 02003ac7 | 5fa058e0 | 03003ae7 | 6c840028 | 5f8c5ec0 | 0000002c | 02000a3f | 66c00030 |

```
0614440  002c5ec0 00000030 01002cef 6c840028 5c9c002c 02000a3f 66c00030 002c5ec0 00000030 01002cef 4b8c0000 000043ef
0614520  5c9c002c 02000a3f 67ec002c 4b8c0000 00002527 5c9c002c 01002cef 6d3c5ec0 00000020 02000a3f 4b8c0000 0000083f
0614600  5a180000 02000a3f 66c0002c 00205ec0 0000002c 02000887 6e58001c 5a180000 02003ff7 6c840018 6c345ec0 00000020
0614660  02000cdf 6c840018 5a180000 01001b87 5a180000 02003ac7 6d3c58e0 03004367 4b8c0000 000043df 6c840024 6c345878
0614740  001c67ec 001c5370 5c9c001c 020031f7 66c00020 001c5ec0 00000020 02004377 6c840018 5a180000 02003ac7 6d3c58e0
0615020  03004367 4b8c0000 000043df 6c840024 6c345ec0 0000001c 02000a3f 66c00020 001c5ec0 00000020 02000887 6b7458e0
0615100  0200412f 6c840018 6c840024 5c9c001c 02000a3f 66c00020 001c5ec0 00000020 02000d0f 66c0002c 00205ec0 0000002c
0615160  02000d27 6c840024 5a180000 02003ca7 6c840028 5fa05ec0 00000020 02000d0f 66c0002c 00205ec0 0000002c 02000d27
0615240  6c840024 5a180000 02003cb7 6c840028 5fa05ec0 00000020 02000d0f 66c0002c 00205ec0 0000002c 02000d27 6c840024
0615320  5a180000 030043e7 6c840028 5f8c71d0 5c9c0020 02000d27 6c840028 6c840024 5c9c001c 02000a3f 66c00020 001c5ec0
0615400  00000020 02000d0f 66c0002c 00205ec0 0000002c 02003bd7 67ec002c 6c840018 5c9c002c 02003ac7 5fa058e0 03003ae7
0615460  6c840028 5f8c5ec0 00000020 02000a3f 66c00028 00205ec0 00000028 01002cef 6c840024 5c9c0020 02000a3f 66c00024
0615540  00205ec0 00000024 01002cef 4b8c0000 000043ef 5c9c0020 02000a3f 67ec0020 4b8c0000 00002527 5c9c0020 01002cef
0615620  6d3c5ec0 0000001c 02000a3f 4b8c0000 0000083f 5a180000 02000887 6e58001c 5a180000 02003ff7 6c840018 6c34477c
0615700  34100028 24d00000 000da4a4 002c34a0 00203eec 0028382c 002439a4 000da4c4 002433d8 3e700020 3af4001c 000d72f4
0615760  001c38e8 3d6c2330 000cc8c0 0031203a 206e6f74 20612073 69676e61 6c20696e 20746865 20736967 6e616c20 61737369
0616040  676e6d65 6e74206f 6e206c69 6e652000 0000029c 000a4a6c b27cb66c 00000456 7fffffff 000a58c0 02000ce5 020031ed
0616120  020031e5 00004367 02000a3d 02000885 000043d7 0000000c 02000a3d 03003695 000036af 00000010 00000014 02000a3d
0616200  02000885 000043f7 00000018 0100371d 00000016 02000a3d 020031f5 02003ebd 0000001c 02003ac5 00000016 03004365
0616260  000043ff 00000020 00000024 02000a3d 02000885 0000000e 0200412d 0000001e 00000022 02000a3d 02000d0d 02000d25
0616340  00000022 02003ca5 00000028 0000002c 02000d0d 02000d25 00000022 02003cb5 0000002a 00000030 02000d0d 02000d25
0616420  00000022 030043e5 0000002a 00000034 00000038 02000d25 0000002a 00000022 02000a3d 02000d0d 02003bd5 02003ac5
0616500  0000003c 03003abd 0000002a 00000040 00000044 0000001e 02000a3d 01002ced 0000002a 02000a3d 01002ced 00004407
0616560  02000a3d 01002ced 00000016 00002527 02000a3d 0000083f 02000a3d 02000885 0000001a 02003ff5 0000001e 00000026
0616640  02000cdd 0000001e 01001b85 02003ac5 00000016 03004365 000043ff 00000022 00000026 020031f5 02004375 0000001e
0616720  02003ac5 00000016 03004365 000043ff 00000022 00000026 02000a3d 02000885 0000000e 0200412d 0000001e 00000022
0617000  02000a3d 02000d0d 02000d25 00000022 02003ca5 0000002a 00000048 02000d0d 02000d25 00000022 02003cb5 0000002a
0617060  0000004c 02000d0d 02000d25 00000022 030043e5 0000002a 00000050 00000054 02000d25 0000002a 00000022 02000a3d
0617140  02000d0d 02003bd5 02003ac5 00000058 03003abd 0000002a 0000005c 00000060 0000001e 02000a3d 01002ced 00000022
0617220  02000a3d 01002ced 00004407 02000a3d 01002ced 00000016 00002527 02000a3d 0000083f 02000985 0000001a 02003ff5
0617300  0000001e 00000026 00002aff 29540474 0002438a 5d100000 03003287 4b8c0000 00004367 60cc56f8 671c55f0 697c0024
0617360  55f06af0 001c55f0 6a005370 58186530 001c5c30 020031f7 65300020 5e540000 02003ebf 67ec0018 5a180000 02003ac7
0617440  69b058e0 03004367 4b8c0000 000043ff 66700024 5c9c0020 02000a3f 66c00028 00205ec0 00000028 02000887 6b7458e0
0617520  0200412f 6c840018 6c840024 5c9c0020 02000a3f 66c00028 00205ec0 00000028 02000d0f 66c00028 002c5ec0 00000028
0617600  02000d27 6c840024 5a180000 02003ca7 67ec0028 5fa05ec0 0000002c 02000d0f 66c00030 002c5ec0 00000030 02000d27
0617660  6c840024 5a180000 02003cb7 6c840028 5fa05ec0 0000002c 02000d0f 66c00030 002c5ec0 00000030 02000d27 6c840024
0617740  5a180000 030043e7 6c840028 5f8c5ec0 0000002c 02000d27 6c840028 6c840024 5c9c0020 02000a3f 66c0002c 00205ec0
0620020  0000002c 02000d0f 66c00030 002c5ec0 00000030 02003bd7 67ec0030 6c840018 5c9c0030 02003ac7 5fa058e0 03003abf
0620100  6c840028 5f8c5ec0 0000002c 02000a3f 66c00030 002c5ec0 00000030 01002cef 6c840028 5c9c002c 02000a3f 66c00030
0620160  002c5ec0 00000030 01002cef 4b8c0000 00004407 5c9c002c 02000a3f 67ec002c 4b8c0000 00002527 5c9c002c 01002cef
0620240  6d3c5ec0 00000020 02000a3f 4b8c0000 0000083f 5a180000 02000a3f 66c0002c 00205ec0 0000002c 02000887 6e58001c
0620320  5a180000 02003ff7 6c840018 6c345ec0 00000020 02000cdf 6c840018 5a180000 01001b87 5a180000 02003ac7 6d3c58e0
0620400  03004367 4b8c0000 000043ff 6c840024 6c345878 001c67ec 001c5370 5c9c001c 020031f7 66c00020 001c5ec0 00000020
0620460  02004377 6c840018 5a180000 02003ac7 6d3c58e0 03004367 4b8c0000 000043ff 6c840024 6c345ec0 0000001c 02000a3f
0620540  66c00020 001c5ec0 00000020 02000887 6b7458e0 0200412f 6c840018 6c840024 5c9c001c 02000a3f 66c00020 001c5ec0
0620620  00000020 02000d0f 66c0002c 00205ec0 0000002c 02000d27 6c840024 5a180000 02003ca7 6c840028 5fa05ec0 00000020
0620700  02000d0f 66c0002c 00205ec0 0000002c 02000d27 6c840024 5a180000 02003cb7 6c840028 5fa05ec0 00000020 02000d0f
0620760  66c0002c 00205ec0 0000002c 02000d27 6c840024 5a180000 030043e7 6c840028 5f8c5ec0 00000020 02000d27 6c840028
0621040  6c840024 71d05ec0 0000001c 02000a3f 66c00020 001c5ec0 00000020 02000d0f 66c0002c 00205ec0 0000002c 02003bd7
0621120  67ec002c 6c840018 5c9c002c 02003ac7 5fa058e0 03003abf 6c840028 5f8c5ec0 00000020 02000a3f 66c00028 00205ec0
0621200  00000028 01002cef 6c840024 5c9c0020 02000a3f 66c00024 00205ec0 00000024 01002cef 4b8c0000 00004407 5c9c0020
0621260  02000a3f 67ec0020 4b8c0000 00002527 5c9c0020 01002cef 6d3c5ec0 0000001c 02000a3f 4b8c0000 0000083f 5a180000
0621340  02000887 6e58001c 5a180000 02003ff7 6c840018 6c34477c 34100028 24d00000 000da4a4 002c3540 001c0020 3fe40018
0621420  002838fc 00243844 320c42ac 000036af 000d7480 002433d8 3e700020 3af4001c 000da514 001c38e8 3d6c2330 000cc8c0
0621500  0000005c 000a51b0 b27cb66c 00000457 7fffffff 000a59ac 02000ce5 020031ed 020031e5 000043d7 02000885 000024ff
```

```
0621560  0000000c 020031f5 0200412d 00000010 00000014 02000885 0000000e 0200412d 00000012 00000016 00002aff 000a5a34
0621640  00000038 b27cb66c 00000458 000004ae 000a5a38 02000ce5 05001b0d 000043d7 0000001b 00002c07 006d2523 000002a3
0621720  00002aff 2c780058 0002438a 5d100000 03003287 4b8c0000 000043d7 60cc56f8 671c5370 581867b8 53705c30 020031f7
0622000  6530001c 5e540000 0200412f 66700018 5c9c001c 02000887 6b7458e0 0200412f 6c840018 6c3422bc 000cfff0 0000008c
0622060  000a58c0 b27cb66c 00000459 7fffffff 000a5b0c 02000ce5 020031ed 020031e5 000043f7 02000a3d 02000885 0000440f
0622140  0000000c 02000885 00004417 00000010 020031f5 02003ff5 00000014 00000001 00000018 0000001c 02000a3d 02000885
0622220  0000000e 02003ff5 00000016 0000001a 02000885 00000012 02003ff5 00000016 0000001e 00002aff 000a5b64 00000038
0622300  b27cb66c 0000045a 000004af 000a5b68 02000ce5 05001b0d 000043f7 0000001b 00002c07 006d28a3 000002a3 00002aff
0622360  2c78009c 0002439a 5d100000 03003287 4b8c0000 000043f7 60cc56f8 671c55f0 682c5370 581867b8 53705c30 020031f7
0622440  6530001c 5e540000 02003ff7 67ec0018 55f06670 00205ec0 0000001c 02000a3f 66c00024 001c5ec0 00000024 02000887
0622520  6b7458e0 02003ff7 6c840018 6c840020 5c9c001c 02000887 6d3c58e0 02003ff7 6c840018 6c344768 33bc247c 000da5fc
0622600  0018386c 3d302340 000da61c 0000005c 000a59ac b27cb66c 0000045b 7fffffff 000a5bf8 02000ce5 020031ed 020031e5
0622660  0000440f 02000885 00003b3f 0000000c 020031f5 02003ff5 00000010 00000014 02000885 0000000e 02003ff5 00000012
0622740  00000016 00002aff 000a5de8 00000038 b27cb66c 0000045c 000004b0 000a5dec 02000ce5 05001b0d 0000440f 0000001b
0623020  00002c07 006d2fe3 000002a3 00002aff 27f00058 000a5c8c 5d100000 03003287 4b8c0000 0000440f 60cc56f8 671c5370
0623100  581867b8 53705c30 020031f7 6530001c 5e540000 02003ff7 66700018 5c9c001c 02000887 6b7458e0 02003ff7 6c840018
0623160  6c3422bc 000d72f4 0000009c 000a5b0c b27cb66c 0000045d 7fffffff 000a5d54 02000ce5 020031ed 020031e5 0000440f
0623240  02000a3d 02000885 00003b3f 0000000c 02000a3d 02003645 00001aef 00000010 02000885 00003b3f 00000014 020031f5
0623320  02003ff5 00000018 02001aed 0000001c 00000020 02000a3d 02000885 0000000e 02003ff5 0000001a 0000001e 02000885
0623400  00000016 02003ff5 0000001a 00000022 00002aff 295400c0 0002438a 5d100000 01003287 4b8c0000 0000440f 60cc56f8
0623460  671c55f0 686855f0 69b05370 581867b8 53705c30 020031f7 6530001c 5e540000 02003ff7 67ec0018 5a180000 02001aef
0623540  66700020 5c9c001c 02000a3f 66c00024 001c5ec0 00000024 02000887 6b7458e0 02003ff7 6c840018 6c840020 5c9c001c
0623620  02000887 6d3c58e0 02003ff7 6c840018 6c344768 3410001c 24d00000 000d72f4 002034e0 00183f68 001c3880 320c42ac
0623700  00001aef 000cc5cc 0018386c 3d302340 000d72f4 00000098 000a5bf8 b27cb66c 0000045e 7fffffff 000a5edc 02000ce5
0623760  020031ed 020031e5 00004417 02000a3d 0100413d 0000000c 02000a3d 02000885 0000440f 00000010 02000885 00004417
0624040  00000014 020031f5 02003ff5 00000018 00000001 0000001c 00000020 02000a3d 02000885 00000012 02003ff5 0000001a
0624120  0000001e 02000885 00000016 02003ff5 0000001a 00000022 00002aff 000a5fa0 00000038 b27cb66c 0000045f 000004b1
0624200  000a5fa4 02000ce5 05001b0d 00004417 0000001b 00002c07 006d30e3 000002a3 00002aff 27f000b8 000a5f10 5d100000
0624260  03003287 4b8c0000 00004417 60cc56f8 671c55f0 686855f0 69b05370 581867b8 53705c30 020031f7 6530001c 5e540000
0624340  02003ff7 67ec0018 55f06670 00205ec0 0000001c 02000a3f 66c00024 001c5ec0 00000024 02000887 6e0858c0 02003ff7
0624420  6c840018 6c840020 5c9c001c 02000887 6d3c58e0 02003ff7 6c840018 6c344768 34a0001c 364035c8 31f0247c 000d0090
0624500  002033bc 3e70001c 3c480000 000da5fc 0018386c 3d302340 000da61c 0000003c 000a5d54 b27cb66c 00000460 7fffffff
0624560  000a5f48 02000ce5 020031ed 020031e5 00004417 00000007 02003ff5 0000000c 00000007 00002aff 29540030 0002438a
0624640  5d100000 03003287 4b8c0000 00004417 537055f0 671c5370 5d100000 02003ff7 5fa05370 4960228c 0000005c 000a5e4c
0624720  b27cb66c 00000461 7fffffff 000a6034 02000ce5 020031ed 020031e5 0000438f 02000885 00003b3f 0000000c 020031f5
0625000  02003ebd 00000010 00000014 02000885 0000000e 02003ff5 00000012 00000016 00002aff 000a6090 00000038 b27cb66c
0625060  00000462 000004b2 000a6094 02000ce5 05001b0d 0000438f 0000001b 00002c07 006d1263 000002a3 00002aff 2c780058
0625140  0002438a 5d100000 03003287 4b8c0000 0000438f 60cc56f8 671c5370 581867b8 53705c30 020031f7 6530001c 5e540000
0625220  02003ebf 66700018 5c9c001c 02000887 6b7458e0 02003ff7 6c840018 6c3422bc 000d72f4 00000060 000a5f48 b27cb66c
0625300  00000463 7fffffff 000a618c 02000ce5 020031ed 020031e5 0000439f 02000a3d 02003645 00003437 0000000c 02000a3d
0625360  02003645 0000214f 00000010 0100371d 00000012 02003ebd 00000014 00000007 00002aff 000a63ec 00000070 b27cb66c
0625440  00000464 000004b3 000a63f0 02000ce5 05001b0d 0000439f 0000001b 00002c07 006d1463 000002a3 00002aff 000a63ec
0625520  00000038 b27cb66c 00000497 000004c5 000a8d8c 02000ce5 05001b0d 0000446f 0000001b 00002c07 006d7bc3 000002a3
0625600  00002aff 000dfc7c 000daf40 27f00080 000a6220 5d100000 03003287 4b8c0000 0000439f 60cc56f8 671c55f0 687c001c
0625660  55f06a00 53705818 67b85370 5e540000 02003ebf 5fa05370 36a4477c 35400018 0020362c 320c42ac 00003437 000cc5cc
0625740  00243500 00183f68 00203894 001c3310 41000000 0000214f 000cc5cc 001c38e8 3d6c37f0 3cf4234c 000cc8c0 0000009c
0626020  000a6034 b27cb66c 00000465 7fffffff 000a6318 02000ce5 020031ed 020031e5 0000439f 02000a3d 02003645 00003427
0626100  0000000c 02000a3d 02000885 00004097 00000010 02000a3d 02003645 00003437 00000014 02000a3d 02003645 0000214f
0626160  00000018 0100371d 0000001a 020031f5 02003ebd 0000001c 01003425 00000020 02000885 00000012 02004375 0000001e
0626240  00000022 00002aff 295400f0 0002438a 5d100000 03003287 4b8c0000 0000439f 60cc56f8 671c55f0 687c002c 55f06af0
0626320  002455f0 6af0001c 55f06a00 53705818 67b85370 5e540000 020031f7 6530001c 5e540000 02003ebf 67ec0018 5a180000
0626400  01003427 67b85ec0 0000001c 02000887 6e58002c 5a180000 02004377 6c840018 6c3436a4 477c3540 00180030 362c320c
0626460  43000000 00003427 000cc5cc 00343410 00283e70 00303c9c 0000002c 000cf7d8 002c3540 00180020 3f680028 38940024
0626540  320c42ac 00003437 000cc5cc 00243500 00183f68 00203894 001c3310 43000000 0000214f 000cc5cc 001c38e8 3d6c37f0
0626620  3cf4234c 000cc8c0 000000d8 000a618c b27cb66c 00000466 7fffffff 000a6558 02000ce5 020031ed 020031e5 00004397
```

| | | | | | | | | | | | | |
|---|---|---|---|---|---|---|---|---|---|---|---|---|
| 0626700 | 02000a3d | 02003645 | 0000342f | 0000000c | 02000a3d | 02000885 | 0000438f | 00000010 | 02000a3d | 02003645 | 00003517 | 00000014 |
| 0626760 | 02000a3d | 02000885 | 00004097 | 00000018 | 02000885 | 00004397 | 0000001c | 020031f5 | 02003ebd | 00000020 | 0300342d | 00000024 |
| 0627040 | 00000028 | 0000002c | 02000a3d | 02000885 | 00000012 | 02003eb4 | 00000022 | 00000026 | 02000a3d | 02000885 | 0000001a | 02004375 |
| 0627120 | 00000022 | 0000002a | 02000885 | 0000001e | 02003ebd | 00000022 | 0000002e | 00002aff | 000a6630 | 00000038 | b27cb66c | 00000467 |
| 0627200 | 000004b4 | 000a6634 | 02000ce5 | 05001b0d | 00004397 | 0000001b | 00002c07 | 006d1363 | 000002a3 | 00002aff | 27f00130 | 000a658c |
| 0627260 | 54100000 | 03003287 | 4b8c0000 | 00004397 | 60cc56f8 | 671c55f0 | 687c0028 | 55f06af0 | 002055f0 | 6aa055f0 | 69b05370 | 581867b8 |
| 0627340 | 53705c30 | 020031f7 | 6530001c | 5e540000 | 02003ebf | 67ec0018 | 5a180000 | 0300342f | 67ec0024 | 66700020 | 5c9c001c | 02000a3f |
| 0627420 | 66c00028 | 001c5ec0 | 00000028 | 02000887 | 6e580028 | 5a180000 | 02003ebf | 6c840018 | 6c840024 | 5c9c001c | 02000a3f | 66c00024 |
| 0627500 | 001c5ec0 | 00000024 | 02000887 | 6e0858e0 | 02004377 | 6c840018 | 6c840020 | 5c9c001c | 02000887 | 6d3c58e0 | 02003ebf | 6c840018 |
| 0627560 | 6c3436a4 | 47683540 | 0018002c | 362c320c | 43000000 | 0000342f | 000cc5cc | 00303410 | 00243e70 | 002c3c9c | 00000029 | 000da24c |
| 0627640 | 00283540 | 0018001c | 3f680024 | 38940020 | 320c42ac | 00003517 | 000cc5cc | 002033bc | 3e70001c | 3c480000 | 000cf7d9 | 0018386c |
| 0627720 | 34302340 | 000da26c | 0000003c | 000a6318 | b27cb66c | 00000468 | 7fffffff | 000a65c4 | 02000ce5 | 020031ed | 020031e5 | 00004397 |
| 0630000 | 00000007 | 02003ebd | 0000000c | 00000007 | 00002aff | 29540030 | 0002438a | 5d100000 | 03003287 | 4b8c0000 | 00004397 | 537055f0 |
| 0630060 | 671c5370 | 5d100000 | 02003ebf | 5fa05370 | 4960228c | 00000070 | 000a6558 | b27cb66c | 00000469 | 7fffffff | 000a66f0 | 02000ce5 |
| 0630140 | 020031ed | 020031e5 | 000043a7 | 02000a3d | 02003645 | 00003447 | 0000000c | 02000885 | 0000441f | 00000010 | 020031f5 | 02003ebd |
| 0630220 | 00000014 | 01003445 | 00000018 | 02000885 | 00000012 | 02003ff5 | 00000016 | 0000001a | 00002aff | 000a6908 | 00000038 | b27cb66c |
| 0630300 | 0000046a | 000004b5 | 000a45f4 | 02000ce5 | 05001b0d | 000043a7 | 0000001b | 00002c07 | 006d1563 | 000002a3 | 00002aff | 27f00084 |
| 0630360 | 000a44dc | 5d100000 | 03003287 | 4b8c0000 | 000043a7 | 60cc56f8 | 671c55f0 | 682c5370 | 581867b8 | 53705c30 | 020031f7 | 6530001c |
| 0630440 | 5e540000 | 02003ebf | 67ec0018 | 5a180000 | 01003447 | 67b85ec0 | 0000001c | 02000887 | 6d3c58e0 | 02003ff7 | 6c840018 | 6c3436a4 |
| 0630520 | 476834e0 | 0018362c | 320c42ac | 00003447 | 000cc5cc | 0018386c | 3d302340 | 000da5dc | 00000070 | 000a65c4 | b27cb66c | 0000046b |
| 0630600 | 7fffffff | 000a4568 | 02000ce5 | 020031ed | 020031e5 | 000043a7 | 02000a3d | 02003645 | 00003567 | 0000000c | 02000885 | 0000438f |
| 0630660 | 00000010 | 020031f5 | 02003ebd | 00000014 | 01003565 | 00000018 | 02000885 | 00000012 | 02003ebd | 00000016 | 0000001a | 00002aff |
| 0630740 | 00000064 | 000a88b8 | b27cb66c | 00000494 | 7fffffff | 0009dc68 | 02000ce5 | 020031ed | 020031e5 | 00004467 | 02000885 | 00003b27 |
| 0631020 | 0000000c | 020031f5 | 02003ebd | 00000010 | 00000001 | 00000014 | 00000007 | 02000885 | 0000000e | 02003ff5 | 00000012 | 00000016 |
| 0631100 | 00002aff | b4640000 | 000a6764 | 000db028 | 29380020 | 0009f0c4 | 54100000 | 02000a3f | 62c05758 | 6bf46750 | 305022bc | 000a891c |
| 0631160 | 00046e6f | 64650098 | ffffffff | 03003257 | 00002c07 | 0000000c | 000a6820 | 000a6820 | 0001003f | 00000000 | 000032bf | b328cbe8 |
| 0631240 | 000a8a80 | 00000000 | 2cac1b97 | 0002438a | 2ca06821 | 00000000 | 00000001 | 0009ef38 | 000a4770 | 000a477a | 0009caac | 000032a7 |
| 0631320 | b3280010 | 0009edfc | 00000000 | 00046578 | 79720000 | 0009ec98 | 00000000 | 00057462 | 6f647900 | ffffffff | 0300325f | 00002c07 |
| 0631400 | 0000000c | 000a68c0 | 000a68c0 | 0001003f | 00000000 | 0000327f | b3286889 | 000a4890 | 00000000 | 0000327f | b328cbe8 | 000a48e8 |
| 0631460 | 00000000 | 27f00014 | 000a68e4 | 4e1c0000 | 00000007 | 49602edc | 2cac1b97 | 0002438a | 2ca068c1 | 00000000 | 00000001 | 000a68ac |
| 0631540 | 000a68e4 | 000a68ee | 000a468c | 29540020 | 0002438a | 56f86580 | 001836a4 | 45506c84 | 00186c08 | 239c0000 | 000a687c | 000a6c74 |
| 0631620 | 00000058 | b288b66c | 00000076 | 7fffffff | 000a895c | 02000ce5 | 0100147d | 01002d65 | 0000000b | 00002aff | 000a69cc | 0000002c |
| 0631700 | b288b66c | 00000076 | 7fffffff | 000a690c | 02000ce5 | 0100147d | 01002d65 | 0000000b | 00002aff | 00312f68 | 6f6d652f | 6f736173 |
| 0631760 | 312f612f | 73726565 | 2f70726f | 6c6f672d | 74726961 | 6c732f64 | 6374672f | 64637467 | 312f7462 | 6f647900 | 00342f68 | 6f6d652f |
| 0632040 | 6f736173 | 312f612f | 73726565 | 2f70726f | 6c6f672d | 74726961 | 6c732f64 | 6374672f | 64637467 | 312f7462 | 6f64792e | 706c0065 |
| 0632120 | 27f000c4 | 000a6b04 | 5d100000 | 03003287 | 4b8c0000 | 000043c7 | 60cc56f8 | 671c55f0 | 686855f0 | 69b05370 | 581867b8 | 53705c30 |
| 0632200 | 020031f7 | 6530001c | 5e540000 | 02003ebf | 67ec0018 | 5a180000 | 020034e7 | 66700020 | 5c9c001c | 02000a3f | 66c00024 | 001c5ec0 |
| 0632260 | 00000024 | 02000887 | 6e0858e0 | 02003ff7 | 6c840018 | 6c840020 | 5c9c001c | 02000887 | 6d3c58e0 | 02003ebf | 6c840018 | 6c3436a4 |
| 0632340 | 47683540 | 0018001c | 362c320c | 43000000 | 000034e7 | 000cc5cc | 00202ecc | 33bc3e70 | 001c3aa0 | 000d72f4 | 0018386c | 34302340 |
| 0632420 | 000da990 | 00000078 | 000a4910 | b27cb66c | 00000470 | 7fffffff | 000a6b94 | 02000ce5 | 020031ed | 020031e5 | 000043c7 | 02000a3d |
| 0632500 | 02003645 | 000034ff | 0000000c | 02000a3d | 0000083f | 02000885 | 00003b3f | 00000010 | 020031f5 | 02003ebd | 00000014 | 010034fd |
| 0632560 | 00000018 | 02000885 | 00000012 | 02003ff5 | 00000016 | 0000001a | 00002aff | 28c40088 | 000a6bc8 | 54100000 | 03003287 | 4b8c0000 |
| 0632640 | 000043c7 | 60cc56f8 | 671c55f0 | 682c5370 | 581867b8 | 53705c30 | 020031f7 | 6530001c | 5e540000 | 02003ebf | 67ec0018 | 5a180000 |
| 0632720 | 010034ff | 67b85ec0 | 0000001c | 02000887 | 6d3c58e0 | 02003ff7 | 6c840018 | 6c3436a4 | 476834e0 | 0018362c | 320c42ac | 000034ff |
| 0633000 | 000cc5cc | 00182ecc | 386c3d30 | 24200000 | 000d72f4 | 0000003c | 000a6a94 | b27cb66c | 00000471 | 7fffffff | 000a6c00 | 02000ce5 |
| 0633060 | 020031ed | 020031e5 | 000043c7 | 00000007 | 02003ebd | 0000000c | 00000007 | 00002aff | 29540030 | 0002438a | 54100000 | 03003287 |
| 0633140 | 4b8c0000 | 000043c7 | 537055f0 | 671c5370 | 54100000 | 02003ebf | 5fa05370 | 4960228c | 00000078 | 000a6b94 | b27cb66c | 00000472 |
| 0633220 | 7fffffff | 000a6d38 | 02000ce5 | 020031ed | 020031e5 | 0000442f | 02000a3d | 02003645 | 000034ff | 0000000c | 02000a3d | 0000083f |
| 0633300 | 02000885 | 00003b3f | 00000010 | 020031f5 | 02003ebd | 00000014 | 010034fd | 00000018 | 02000885 | 00000012 | 02003ff5 | 00000016 |
| 0633360 | 0000001a | 00002aff | 000a6e14 | 00000038 | b27cb66c | 00000473 | 000004b8 | 000a6e18 | 02000ce5 | 05001b0d | 0000442f | 0000001b |
| 0633440 | 00002c07 | 006d4c83 | 000002a3 | 00002aff | 27f00088 | 000a6d6c | 5d100000 | 03003287 | 4b8c0000 | 0000442f | 60cc56f8 | 671c55f0 |
| 0633520 | 682c5370 | 581867b8 | 53705c30 | 020031f7 | 6530001c | 5e540000 | 02003ebf | 67ec0018 | 5a180000 | 010034ff | 67b85ec0 | 0000001c |
| 0633600 | 02000887 | 6d3c58e0 | 02003ff7 | 6c840018 | 6c3436a4 | 476834e0 | 0018362c | 320c42ac | 000034ff | 000cc5cc | 00182ecc | 386c3d30 |
| 0633660 | 24200000 | 000d72f4 | 0000003c | 000a6c00 | b27cb66c | 00000474 | 7fffffff | 000a6da4 | 02000ce5 | 020031ed | 020031e5 | 0000442f |
| 0633740 | 00000007 | 02003ebd | 0000000c | 00000007 | 00002aff | 29540030 | 0002438a | 5d100000 | 03003287 | 4b8c0000 | 0000442f | 537055f0 |

```
0634020  671c5370 5d100000 02003ebf 5fa05370 4960228c 00000074 000a6d38 b27cb66c 00000475 7fffffff 000a6ed8 02000ce5
0634100  020031ed 020031e5 000043cf 02000a3d 02003645 0000000c 00000010 02000885 00004437 00000014 020031f5 02003ebd
0634160  00000018 020043cd 0000000e 0000001c 02000885 00000016 02003ebd 0000001a 0000001e 00002aff 000a7078 00000038
0634240  b27cb66c 00000476 000004b9 000a707c 02000ce5 05001b0d 000043cf 0000001b 00002c07 006d1fa3 000002a3 00002aff
0634320  27f00088 000a6f34 5d100000 03003287 4b8c0000 000043cf 64205818 67ec001c 55f0682c 537056f8 671c5370 5d100000
0634400  020031f7 61100020 5d100000 02003ebf 67ec0018 5a180000 020043cf 60cc5ec0 00000020 02000887 6d3c58e0 02003ebf
0634460  6c840018 6c3436a4 476834e0 00183678 001c320c 24d00000 000cc5cc 0018386c 34302340 000daaac 00000064 000a6da4
0634540  b27cb66c 00000477 7fffffff 000a6fa0 02000ce5 020031ed 020031e5 000043cf 02000885 00004437 0000000c 020031f5
0634620  02003ebd 00000010 020043cd 00000007 00000014 02000885 0000000e 02003ebd 00000012 00000016 00002aff 29c40064
0634700  000a6fd4 5d100000 03003287 4b8c0000 000043cf 60cc56f8 671c5370 591867b8 53705c30 020031f7 6530001c 5e540000
0634760  02003ebf 67ec0018 5a180000 020043cf 537067b8 5c9c001c 02000887 6b7458e0 02003ebf 6c840018 6c3422bc 000daaac
0635040  0000003c 000a6ed8 b27cb66c 00000478 7fffffff 000a700c 02000ce5 020031ed 020031e5 000043cf 00000007 02003ebd
0635120  0000000c 00000007 00002aff 29540030 0002438a 5d100000 03003287 4b8c0000 000043cf 537055f0 671c5370 5d100000
0635200  02003ebf 5fa05370 4960228c 00000070 000a6fa0 b27cb66c 00000479 7fffffff 000a7138 02000ce5 020031ed 020031e5
0635260  00004437 02000a3d 02003645 0000355f 0000000c 02000885 0000439f 00000010 020031f5 02003ebd 00000014 0100355d
0635340  00000018 02000885 00000012 02003ebd 00000016 0000001a 00002aff 000a7290 00000038 b27cb66c 0000047a 000004ba
0635420  000a7294 02000ce5 05001b0d 00004437 0000001b 00002c07 006d5563 000002a3 00002aff 27f00084 000a716c 5d100000
0635500  03003287 4b8c0000 00004437 60cc56f8 671c55f0 682c5370 581867b8 53705c30 020031f7 6530001c 5e540000 02003ebf
0635560  67ec0018 5a180000 0100355f 67b85ec0 0000001c 02000887 6d3c58e0 02003ebf 6c840018 6c3436a4 476834e0 0018362c
0635640  320c42ac 0000355f 000cc5cc 0018386c 34302340 000da24c 0000003c 000a700c b27cb66c 0000047b 7fffffff 000a71a4
0635720  02000ce5 020031ed 020031e5 00004437 00000007 02003eb1 0000000c 00000007 00002aff 29540030 0002438a 5d100000
0636000  03003287 4b8c0000 00004437 537055f0 671c5370 5d100000 02003ebf 5fa05370 4960228c 000000f0 000a7138 b27cb66c
0636060  0000047c 7fffffff 000a74ac 02000ce5 020031ed 020031e5 00003eef 02000a3d 02003645 00001d77 0000000c 02000a3d
0636140  02000885 000040d7 00000010 02000a3d 010040dd 00000014 02000a3d 02000885 00003c57 00000018 02000a3d 02000885
0636220  000040ef 0000001c 0100371d 00000016 020031f5 01003ebd 00000020 02000a3d 02000885 00000012 02003ebd 00000022
0636300  00000024 02000a3d 02000885 0000001a 02004005 00000022 00000028 02000a3d 02000885 0000001e 02003ff5 00000022
0636360  0000002c 03003af5 00000022 00000016 03001d6d 00000026 0000002a 0000002e 00002aff 000a7310 00000038 b27cb66c
0636440  0000047d 000004bb 000a759c 02000ce5 05001b0d 00003eef 0000001b 00002c07 00663c63 000002a3 00002aff 27f00048
0636520  000a95a8 5d100000 03003287 4b8c0000 000045e7 64205818 67ec001c 537056f8 671c5370 5d100000 0200412f 5fa0671c
0636600  36a43724 00183678 001c320c 239c0000 000cc5cc 000a7598 00000038 00000000 000db0ac 000db118 000db184 00000000
0636660  00000000 00000000 00000000 00000000 000db24d 000dac24 00000000 2c780160 0002438a 5d100000 03003287 4b8c0000
0636740  00003eef 60cc56f8 671c55f0 687c0034 55f06af0 002c55f0 6af00024 001c55f0 6a005370 581867b8 53705c30
0637020  020031f7 66700018 5c9c0018 01003ebf 67ec0020 5e540000 02000a3f 66700018 5c9c0018 02000887 6e580034 5a180000
0637100  02003ebf 6c840020 67ec001c 5e540000 02000a3f 66700018 5c9c0018 02000887 6e580024 5a180000 02004007 6c840020
0637160  67ec0018 5e540000 02000a3f 65300024 5e540000 02000887 6e58001c 5a180000 02003ff7 6c840020 67b85ec0 00000024
0637240  03003af7 6c840020 69b058e0 03001d6f 6c84001c 6c840018 6c3436a4 477c3540 00180038 362c320c 43000000 00001d77
0637320  000cc5cc 003c3410 00303e70 00383c9c 00000034 000cfb54 003434a0 00283eec 0030382c 002c39a4 000cfb74 002c3410
0637400  00203e70 00283c9c 00000024 000cfbb4 002433d8 3e700020 3af4001c 000cfbd4 001c38e8 3d6c2330 000cc8c0 000000f0
0637460  000a71a4 b27cb66c 0000047e 7fffffff 000a7734 02000ce5 020031ed 020031e5 0000408f 02000a3d 02003645 0000354f
0637540  0000000c 02000a3d 02000885 000040d7 00000010 02000a3d 010040dd 00000014 02000a3d 02000885 00003c57 00000018
0637620  02000a3d 02000885 000040ef 0000001c 0100371d 00000016 020031f5 01003ebd 00000020 02000a3d 02000885 00000012
0637700  02003ebd 00000022 00000024 02000a3d 02000885 0000001a 02004005 00000022 00000028 02000a3d 02000885 0000001e
0637760  02003ff5 00000022 0000002c 03003add 00000022 00000016 03003ae5 00000026 0000002a 0000002e 00002aff 000a7810
0640040  00000038 b27cb66c 0000047f 000004bc 000a7814 02000ce5 05001b0d 0000408f 0000001b 00002c07 0067b1e3 000002a3
0640120  00002aff 2c780160 0002438a 5d100000 03003287 4b8c0000 0000408f 60cc56f8 671c55f0 687c0034 55f06af0 002c55f0
0640200  6af00024 55f06af0 001c55f0 6a005370 591867b8 53705c30 020031f7 66700018 5c9c0018 01003ebf 67ec0020 5e540000
0640260  02000a3f 66700018 5c9c0018 02000887 6e580034 5a180000 02003ebf 6c840020 67ec001c 5e540000 02000a3f 66700018
0640340  5c9c0018 02000887 6e580024 5a180000 02004007 6c840020 67ec0018 5e540000 02000a3f 65300024 5e540000 02000887
0640420  6e58001c 5a180000 02003ff7 6c840020 67b85ec0 00000024 03003adf 6c840020 69b058e0 03003ae7 6c84001c 6c840018
0640500  6c3436a4 477c3540 00180038 362c320c 43000000 0000354f 000cc5cc 003c3410 00303e70 00383c9c 00000034 000cfb54
0640560  003434a0 00283eec 0030382c 002c39a4 000cfb74 002c3410 00203e70 00283c9c 00000024 000cfbb4 002433d8 3e700020
0640640  3af4001c 000cfbd4 001c38e8 3d6c2330 000cc8c0 000000e0 000a74ac b27cb66c 00000480 7fffffff 000a7980 02000ce5
0640720  020031ed 020031e5 00003ef7 02000a3d 02003645 00003507 0000000c 02000a3d 02000885 000040d7 00000010 02000a3d
0641000  010040dd 00000014 02000a3d 02000885 03003c57 00000018 0100371d 00000016 020031f5 01003ebd 0000001c 02000a3d
0641060  02000885 00000012 02003ebd 0000001e 00000020 02000a3d 02000885 0000001a 02004005 0000001e 00000024 03003ab5
```

| | | | | | | | | | | | | |
|---|---|---|---|---|---|---|---|---|---|---|---|---|
| 0641140 | 0000001e | 00000016 | 03003abd | 00000022 | 00000001 | 00003507 | 00000001 | 00000007 | 00000001 | 00000026 | 00000007 | 00000007 |
| 0641220 | 00002aff | 000a7d9c | 00000038 | b27cb66c | 00000481 | 000004bd | 000a7da0 | 02000ce5 | 05001b0d | 00003ef7 | 0000001b | 00002c07 |
| 0641300 | 00663d63 | 000002a3 | 00002aff | 27f00134 | 000a7a8c | 5d100000 | 03003287 | 4b8c0000 | 00003ef7 | 60cc56f8 | 671c55f0 | 6d7c002c |
| 0641360 | 55f06af0 | 002455f0 | 6af0001c | 55f06a00 | 53705818 | 67b85370 | 5e540000 | 020031f7 | 66700018 | 5c9c0019 | 01003ebf | 67ec001c |
| 0641440 | 5e540000 | 02000a3f | 66700019 | 5c9c0018 | 02000887 | 6e58002c | 5a180000 | 02003ebf | 6c84001c | 67ec0018 | 5e540000 | 02000a3f |
| 0641520 | 65300020 | 5e540000 | 02000887 | 6e58001c | 5a180000 | 02004007 | 6c84001c | 67b85ec0 | 00000020 | 03003ab7 | 6c84001c | 69b058e0 |
| 0641600 | 03003abf | 6c840018 | 67ec0018 | 53705879 | 00184af8 | 00003507 | 55f05370 | 55f06c34 | 537036a4 | 477c3540 | 00180030 | 362c320c |
| 0641660 | 43000000 | 00003507 | 000cc5cc | 00343410 | 00283e70 | 00303c9c | 0000002c | 000cfb54 | 002c34a0 | 00203eec | 0028382c | 002439a4 |
| 0641740 | 000cfb74 | 002433d8 | 3e700020 | 3af4001c | 000cfbb4 | 001c38e8 | 3d6c2330 | 000cc8c0 | 00000114 | 000a7734 | b27cb66c | 00000482 |
| 0642020 | 7fffffff | 000a7c6c | 02000ce5 | 020031ed | 020031e5 | 00003ef7 | 02000a3d | 02003645 | 00003507 | 0000000c | 02000a3d | 02000885 |
| 0642100 | 000040d7 | 00000010 | 02000a3d | 010040dd | 00000014 | 02000a3d | 02000885 | 00003c57 | 00000018 | 02000a3d | 01003684 | 0000001c |
| 0642160 | 02000a3d | 02000885 | 00003b3f | 00000020 | 0100371d | 0000001e | 020031f5 | 01003ebd | 00000024 | 02000a3d | 02000885 | 00000012 |
| 0642240 | 02003ebd | 00000026 | 00000029 | 02000a3d | 02000885 | 0000001a | 02004005 | 00000026 | 0000002c | 02000a3d | 02000885 | 00000022 |
| 0642320 | 02003ff5 | 00000026 | 00000030 | 03003ab5 | 00000026 | 00000016 | 03003abd | 0000002a | 00000001 | 00003507 | 00000001 | 00000007 |
| 0642400 | 00000001 | 0000002e | 00000007 | 00000032 | 00002aff | 295401a8 | 0002438a | 5d100000 | 03003287 | 4b8c0000 | 00003ef7 | 60cc56f8 |
| 0642460 | 671c55f0 | 6d7c0040 | 55f06af0 | 003855f0 | 6af0002c | 55f06af0 | 002455f0 | 6af0001c | 55f06a00 | 53705818 | 67b85370 | 5e540000 |
| 0642540 | 020031f7 | 66700018 | 5c9c0019 | 01003ebf | 67ec0020 | 5e540000 | 02000a3f | 66700018 | 5c9c0018 | 02000887 | 6e580040 | 5a180000 |
| 0642620 | 02003ebf | 6c840020 | 67ec0018 | 5e540000 | 02000a3f | 6530001c | 5e540000 | 02000887 | 6e58002c | 5a180000 | 02004007 | 6c840020 |
| 0642700 | 67b85ec0 | 0000001c | 02000a3f | 66c0001c | 00245ec0 | 0000001c | 02000987 | 6e58001c | 5a180000 | 02003ff7 | 6c840020 | 67ec001c |
| 0642760 | 5c9c0024 | 03003ab7 | 6c840020 | 6af00034 | 5a180000 | 03003abf | 6c840018 | 67ec0018 | 6c84001c | 58780018 | 4b8c0000 | 00003507 |
| 0643040 | 55f05370 | 55f06c34 | 537036a4 | 477c3540 | 00180044 | 362c320c | 43000000 | 00003507 | 000cc5cc | 00483410 | 003c3e70 | 00443c9c |
| 0643120 | 00000040 | 000cfb54 | 004034a0 | 00303eec | 003c382c | 00383c9c | 00000034 | 000cfb74 | 00343410 | 00283e70 | 00303c9c | 0000002c |
| 0643200 | 000cfbb4 | 002c34a0 | 00203eec | 0028382c | 00243280 | 24d00000 | 000da4c4 | 002433d8 | 3e700020 | 3af4001c | 000d72f4 | 001c38e8 |
| 0643260 | 3d6c37f0 | 3cf4234c | 000cc8c0 | 002a2068 | 61732074 | 6f206265 | 20616e61 | 6c797a65 | 64207072 | 696f7220 | 746f2074 | 68697320 |
| 0643340 | 616e616c | 79736973 | 00000d6f | 00000134 | 000a7980 | b27cb66c | 00000483 | 7fffffff | 000a7fb8 | 02000ce5 | 020031ed | 020031e5 |
| 0643420 | 00003f17 | 02000a3d | 02003645 | 00003547 | 0000000c | 02000a3d | 02003645 | 00000010 | 00000014 | 02000a3d | 01003705 | 00000018 |
| 0643500 | 02000a3d | 02003645 | 0000001c | 00000020 | 02000a3d | 01003705 | 00000024 | 02000a3d | 02003645 | 00001aff | 00000028 | 02000a3d |
| 0643560 | 0100371d | 0000002a | 01002d65 | 02000a3d | 01003a3d | 0000002c | 02000d0d | 02000a65 | 05003b75 | 00000030 | 00003eb7 | 0000001e |
| 0643640 | 00000034 | 00000038 | 02000a3d | 01001b75 | 02003a75 | 0000002e | 00000032 | 02000d0d | 02000a65 | 05003b75 | 0000003c | 00003f2f |
| 0643720 | 0000001e | 00000040 | 00000044 | 01001b75 | 02003a75 | 0000002e | 0000003e | 00002aff | 02000a3d | 01002ced | 0000443f | 02000a3d |
| 0644000 | 01002ced | 0000001e | 02000a3d | 01002ced | 00004447 | 00002527 | 00003ebf | 00002aff | 000a8038 | 00000038 | b27cb66c | 00000484 |
| 0644060 | 000004be | 000a803c | 02000ce5 | 05001b0d | 00003f17 | 0000001b | 00002c07 | 00664203 | 000002a3 | 00002aff | 2c7801e0 | 0002438a |
| 0644140 | 51100000 | 03003287 | 4b8c0000 | 00003f17 | 60cc56f8 | 671c55f0 | 687c0054 | 55f06af0 | 004c55f0 | 6af00044 | 55f06af0 | 003c55f0 |
| 0644220 | 6af00034 | 55f06af0 | 00285370 | 58184af8 | 01003ebf | 537036a4 | 47900030 | 35400018 | 0058362c | 320c42ac | 00003547 | 000cc5cc |
| 0644300 | 005c3540 | 00180050 | 3f680058 | 38940054 | 320c31f0 | 24d00000 | 000cc5cc | 005434a0 | 00483eec | 0050382c | 004c31f0 | 24d00000 |
| 0644360 | 000daccc | 004c3540 | 00180040 | 3f680048 | 38940044 | 320c3280 | 24d00000 | 000cc5cc | 004434a0 | 00383eec | 0040382c | 003c31f0 |
| 0644440 | 24d00000 | 000daccc | 003c3540 | 0018002c | 3f680038 | 38940034 | 33800024 | 43000000 | 00001aff | 000cc5cc | 003438fc | 00303eec |
| 0644520 | 002c382c | 0028411c | 00000024 | 000cc8c0 | 002432b8 | 24d00000 | 000c652c | 00242e7c | ae740020 | 2ba00024 | 00983260 | 00183244 |
| 0644600 | 394441e8 | 00003eb7 | 32f0001c | 24d00000 | 000c8d48 | 0024aa88 | 00202e98 | 44a00000 | 02003a77 | 6d946e1c | 001c43c0 | 02000cdf |
| 0644660 | 4b8c0000 | 00002c07 | 6bb4247c | 0007eb8c | 001c2e7c | ae302ba0 | 001c0042 | 32600018 | 32443844 | 42540000 | 00003f2f | 329c247c |
| 0644740 | 000c8d48 | 001caa6c | 2e9843e4 | 02003a77 | 6d946d50 | 447c0000 | 02000cdf | 4b8c0000 | 00002c07 | 6bb4234c | 0007eb8c | 2c58723c |
| 0645020 | 2c5842ac | 0000443f | 00080d0c | 00104064 | 00080d0c | 000c42ac | 00004447 | 00080d0c | 000c234c | 0007fd0c | 00000084 | 000a7c6c |
| 0645100 | b27cb66c | 00000485 | 7fffffff | 000a8108 | 02000ce5 | 020031ed | 020031e5 | 0000444f | 02000a3d | 02000885 | 00004457 | 0000000c |
| 0645160 | 02000885 | 0000445f | 00000010 | 020031f5 | 0100412d | 00000001 | 00000014 | 00000018 | 02000a3d | 02000885 | 0000000e | 0200412d |
| 0645240 | 0000001c | 00000016 | 02000885 | 00000012 | 0100412d | 0000001a | 00002aff | 000a8194 | 00000038 | b27cb66c | 00000486 | 000004bf |
| 0645320 | 000a8198 | 02000ce5 | 05001b0d | 0000444f | 0000001b | 00002c07 | 006d6ae3 | 000002a3 | 00002aff | 2c780094 | 0002438a | 5d100000 |
| 0645400 | 03003287 | 4b8c0000 | 0000444f | 60cc56f8 | 671c55f0 | 682c5370 | 581867b8 | 53705c30 | 020031f7 | 65300018 | 5e540000 | 0100412f |
| 0645460 | 55f06670 | 001c5ec0 | 00000019 | 02000a3f | 66c00020 | 00185ec0 | 00000020 | 02000887 | 6b7458e0 | 0200412f | 5fa06c84 | 001c5ec0 |
| 0645540 | 00000018 | 02000887 | 6d3c59e0 | 0100412f | 6c344768 | 33bc247c | 000dad8c | 0018386c | 3d302340 | 000dadac | 00000090 | 000a7fb8 |
| 0645620 | b27cb66c | 00000487 | 7fffffff | 000a8280 | 02000ce5 | 020031ed | 020031e5 | 0000445f | 02000a3d | 0100413d | 0000000c | 02000a3d |
| 0645700 | 02000885 | 00004457 | 00000010 | 02000885 | 0000445f | 00000014 | 020031f5 | 0100412d | 00000001 | 00000018 | 0000001c | 02000a3d |
| 0645760 | 02000885 | 00000012 | 0200412d | 00000020 | 0000001a | 02000885 | 00000016 | 0100412d | 0000001e | 00002aff | 000a838c | 00000038 |
| 0646040 | b27cb66c | 00000488 | 000004c0 | 000a8390 | 02000ce5 | 05001b0d | 0000445f | 0000001b | 00002c07 | 006d6d63 | 000002a3 | 00002aff |
| 0646120 | 27f000b0 | 000a82b0 | 5d100000 | 03003287 | 4b8c0000 | 0000445f | 60cc56f8 | 671c55f0 | 686855f0 | 69b05370 | 581867b8 | 53705c30 |
| 0646200 | 020031f7 | 65300018 | 5e540000 | 0100412f | 55f06670 | 001c5ec0 | 00000018 | 02000a3f | 66c00020 | 00185ec0 | 00000020 | 02000887 |

| | | | | | | | | | | | | |
|---|---|---|---|---|---|---|---|---|---|---|---|---|
| 0646260 | 6e0858e0 | 0200412f | 5fa06c84 | 001c5ec0 | 00000018 | 02000887 | 6d3c58e0 | 0100412f | 6c344768 | 34a0001c | 364035c8 | 31f0247c |
| 0646340 | 000d0090 | 002033bc | 3e70001c | 3c480000 | 000dad8c | 0018386c | 3d302340 | 000dadac | 00000038 | 000a8108 | b27cb6bc | 00000489 |
| 0646420 | 7fffffff | 000a82e8 | 02000ce5 | 020031ed | 020031e5 | 0000445f | 00000007 | 0100412d | 00000007 | 00002aff | 2954002e | 0002438a |
| 0646500 | 5d100000 | 03003287 | 4b8c0000 | 0000445f | 537055f0 | 671c5370 | 5d100000 | 0100412f | 53704960 | 228c82e5 | 000000a8 | 000a8280 |
| 0646560 | b27cb66c | 0000048a | 7fffffff | 000a84b0 | 02000ce5 | 020031ed | 020031e5 | 0000437f | 02000a3d | 02003645 | 0000355f | 0000000c |
| 0646640 | 02000a3d | 02000885 | 00004337 | 00000010 | 02000a3d | 0100367d | 00000014 | 02000885 | 00004097 | 00000018 | 020031f5 | 02003ebd |
| 0646720 | 0000001c | 0200355d | 00000020 | 00000024 | 02000a3d | 02000885 | 00000012 | 02003ebd | 0000001e | 00000022 | 02000885 | 0000001a |
| 0647000 | 02004375 | 0000001e | 00000026 | 00002aff | 000a8538 | 00000038 | b27cb66c | 0000048b | 000004c1 | 000a853c | 02000ce5 | 05001b0d |
| 0647060 | 0000437f | 0000001b | 00002c07 | 006d0e83 | 000002a3 | 00002aff | 2c7800e8 | 0002438a | 5d100000 | 03003287 | 4b8c0000 | 0000437f |
| 0647140 | 60cc56f8 | 671c55f0 | 687c0020 | 55f06aa0 | 55f069b0 | 53705819 | 67b85370 | 5e540000 | 020031f7 | 6530001c | 5e540000 | 02003ebf |
| 0647220 | 67ec0018 | 5a180000 | 0200355f | 66700020 | 5c9c001c | 02000a3f | 66c00024 | 001c5ec0 | 00000024 | 02000887 | 6e580020 | 5a180000 |
| 0647300 | 02003ebf | 6c840018 | 6c840020 | 5c9c001c | 02000887 | 6d3c58e0 | 02004377 | 6c840018 | 6c3436a4 | 47583540 | 00180024 | 362c320c |
| 0647360 | 43000000 | 0000355f | 000cc5cc | 00283410 | 001c3e70 | 00243c9c | 00000020 | 000d7e4c | 0020344c | 3eec001c | 381831f0 | 24d00000 |
| 0647440 | 000d7e6c | 0018386c | 3d302340 | 000cf7d8 | 0000008c | 000a82e8 | b27cb66c | 0000048c | 7fffffff | 000a8614 | 02000ce5 | 020031ed |
| 0647520 | 020031e5 | 00004387 | 02000a3d | 02000885 | 0000437f | 0000000c | 02000885 | 00004387 | 00000010 | 020031f5 | 02003ebd | 00000014 |
| 0647600 | 02004385 | 00000018 | 0000001c | 02000a3d | 02000885 | 0000000e | 02003ebd | 00000016 | 0000001a | 02000885 | 00000012 | 02003ebd |
| 0647660 | 00000016 | 0000001e | 00002aff | 000a8708 | 00000038 | b27cb66c | 0000048d | 000004c2 | 000a870c | 02000ce5 | 05001b0d | 00004387 |
| 0647740 | 0000001b | 00002c07 | 006d0f83 | 000002a3 | 00002aff | 27f000a0 | 000a8648 | 5d100000 | 03003287 | 4b8c0000 | 00004387 | 60cc56f8 |
| 0650020 | 671c55f0 | 682c5370 | 581867b8 | 53705c30 | 020031f7 | 6530001c | 5e540000 | 02003ebf | 67ec0018 | 5a180000 | 02004387 | 66700020 |
| 0650100 | 5c9c001c | 02000a3f | 66c00024 | 001c5ec0 | 00000024 | 02000887 | 6b7458e0 | 02003ebf | 6c840018 | 6c840020 | 5c9c001c | 02000887 |
| 0650160 | 6d3c58e0 | 02003ebf | 6c840018 | 6c344768 | 33bc247c | 000da1d0 | 0018386c | 3d302340 | 000da1f0 | 0000003c | 000a84b0 | b27cb66c |
| 0650240 | 0000048e | 7fffffff | 000a8680 | 02000ce5 | 020031ed | 020031e5 | 00004387 | 00000007 | 02003ebd | 0000000c | 00000007 | 00002aff |
| 0650320 | 29540030 | 0002438a | 5d100000 | 03003287 | 4b8c0000 | 00004387 | 537055f0 | 671c5370 | 5d100000 | 02003ebf | 5fa05370 | 4960228c |
| 0650400 | 0000008c | 000a8614 | b27cb66c | 0000048f | 7fffffff | 000a87e0 | 02000ce5 | 020031ed | 020031e5 | 00004337 | 02000a33 | 02000885 |
| 0650460 | 00004467 | 0000000c | 02000885 | 0000446f | 00000010 | 020031f5 | 02003ebd | 00000014 | 00000001 | 00000018 | 0000001c | 02000a3d |
| 0650540 | 02000885 | 0000000e | 02003eb1 | 00000016 | 0000001a | 02000885 | 00000012 | 02003ebd | 00000016 | 0000001e | 00002aff | 000a8828 |
| 0650620 | 00000038 | b27cb66c | 00000490 | 000004c3 | 000a882c | 02000ce5 | 05001b0d | 00004337 | 0000001b | 00002c07 | 006bf263 | 000002a3 |
| 0650700 | 00002aff | 2c78009c | 0002438a | 5d100000 | 03003287 | 4b8c0000 | 00004337 | 60cc56f8 | 671c55f0 | 682c5370 | 581867b8 | 53705c30 |
| 0650760 | 020031f7 | 6530001c | 5e540000 | 02003ebf | 67ec0018 | 55f06670 | 00205ec0 | 0000001c | 02000a3f | 66c00024 | 001c5ec0 | 00000024 |
| 0651040 | 02000887 | 6b7458e0 | 02003ebf | 6c840018 | 6c840020 | 5c9c001c | 02000887 | 6d3c58e0 | 02003ebf | 6c840018 | 6c344768 | 33bc247c |
| 0651120 | 000daf58 | 0018386c | 3d302340 | 000daf78 | 0000004c | 000a8680 | b27cb66c | 00000491 | 7fffffff | 000a88b8 | 02000ce5 | 020031ed |
| 0651200 | 020031e5 | 00004467 | 02003645 | 0000349f | 0000000c | 02003ebd | 00000010 | 00000001 | 0000349f | 00000007 | 00002aff | 000a8958 |
| 0651260 | 00000038 | b27cb66c | 00000492 | 000004c4 | 000a60cc | 02000ce5 | 05001b0d | 00004467 | 0000001b | 00002c07 | 006d7ac3 | 000002a3 |
| 0651340 | 00002aff | 27f00054 | 000b0b14 | 5d100000 | 03003287 | 4b8c0000 | 00004467 | 60cc56f8 | 671c5370 | 581867b8 | 53705c30 | 02003ebf |
| 0651420 | 5fa055f0 | 4b8c0000 | 0000349f | 537036a4 | 37240018 | 362c120c | 42400000 | 0000349f | 239c0000 | 000cc5cc | 0000004c | 000a87e0 |
| 0651500 | b27cb66c | 00000493 | 7fffffff | 000a6760 | 02000ce5 | 020031ed | 020031e5 | 00004467 | 02003645 | 0000000c | 00000019 | 02003ebd |
| 0651560 | 00000014 | 00000001 | 0000000e | 00000007 | 00002aff | 000a7375 | 62747970 | 65646566 | 00000000 | ffffffff | 02002327 | 00002c07 |
| 0651640 | 00000008 | 000a8aa0 | 000aeb58 | 00010043 | 00000000 | 27f00007 | 000a4a14 | 2ca0892a | 00000000 | 00000001 | 000a49ac | 000a4a14 |
| 0651720 | 0002438a | 000a8950 | 000a49b8 | 000a8a4c | 00000058 | b288b66c | 00000080 | 7fffffff | 000aaab8 | 02000ce5 | 0100147d | 01002d65 |
| 0652000 | 0000000b | 00002aff | 000a8a4c | 0000002c | b288b66c | 00000080 | 7fffffff | 000a895c | 02000ce5 | 0100147d | 01002d65 | 0000000b |
| 0652060 | 00002aff | 00322f68 | 6f6d652f | 6f736173 | 312f612f | 73726565 | 2f70726f | 6c6f672d | 74726961 | 6c732f64 | 6374672f | 64637467 |
| 0652140 | 312f7072 | 65747479 | 005b5b4e | 00352f68 | 6f6d652f | 6f736173 | 312f612f | 73726565 | 2f70726f | 6c6f672d | 74726961 | 6c732f64 |
| 0652220 | 6374672f | 64637467 | 312f7072 | 65747479 | 2e706c00 | 0000002c | 000aab7c | b27cb66c | 00000082 | 7fffffff | 0009edf8 | 02000ce5 |
| 0652300 | 0200293d | 000032bf | 00000213 | 00002aff | 000a8bb4 | 0000002c | b288b66c | 00000081 | 7fffffff | 000a8a24 | 02000ce5 | 0100147d |
| 0652360 | 01002d65 | 0000000b | 00002aff | 0000002c | 000aac14 | b27cb66c | 00000089 | 7fffffff | 0009f0a0 | 02000ce5 | 02001f6d | 000032bf |
| 0652440 | 00002c07 | 00002aff | 27f00014 | 000aeb34 | 57586b48 | 53709294 | 936c2edc | 00000068 | 0009de68 | b27cb66c | 00000496 | 7fffffff |
| 0652520 | 000a8cac | 02000ce5 | 020031ed | 020031e5 | 0000446f | 02000a3d | 0100373d | 0000000c | 02000885 | 00004337 | 00000010 | 020031f5 |
| 0652600 | 02003ebd | 00000014 | 00000018 | 02000885 | 00000012 | 02003ebd | 00000016 | 0000001a | 00002aff | 2c780028 | 0002438a | 35c82520 |
| 0652660 | 437c3280 | 24d00000 | 000cc74c | 001041e8 | 000044df | 3cf4234c | 000b0b9c | 2938003c | 000a8b80 | 5d100000 | 02000a3f | 62c05bc4 |
| 0652740 | 02000a3f | 65300018 | 44c40000 | 02000a3f | 6c840018 | 6b7443c0 | 02000a3f | 6c346bf4 | 239c0000 | 000a4740 | 28c40030 | 000acaec |
| 0653020 | 5d100000 | 02000a3f | 671c682c | 5d7c0000 | 02000a3f | 67506a00 | 3050247c | 000a4740 | 00142330 | 000a4740 | 000a8d88 | 00000038 |
| 0653100 | b130b66c | 00000086 | 0000008b | 000a8b21 | 02000ce5 | 05001b0d | 00001cf7 | 00000013 | 00002c07 | 00554dc3 | 00000213 | 00002aff |
| 0653160 | 2c780048 | 0002438a | 45c446d8 | 93149a90 | a334aab4 | 0100a354 | 30502e7c | ac082ba0 | 00140016 | 37f04cc4 | fffffffb | a8582e98 |
| 0653240 | 37884a7c | 000c723c | 2c584550 | 6d505370 | 24200000 | 0007fccc | 27f00074 | 000a8ce0 | 5d100000 | 03003287 | 4b8c0000 | 0000446f |
| 0653320 | 60cc56fd | 671c55f0 | 682c5370 | 581867b8 | 53705c30 | 020031f7 | 6530001c | 5e540000 | 02003ebf | 66700018 | 5c9c001c | 02000887 |

| | | | | | | | | | | | | |
|---|---|---|---|---|---|---|---|---|---|---|---|---|
| 0653400 | 6d3c58e0 | 02003ebf | 6c840018 | 6c344768 | 344c3640 | 35c831f0 | 24d00000 | 000a0de8 | 0018386c | 3d302340 | 000d7e4c | 0000003c |
| 0653460 | 000a8abc | b27cb66c | 00000498 | 7fffffff | 000a8d18 | 02000ce5 | 020031ed | 020031e5 | 0000446f | 00000007 | 02003ebd | 0000000c |
| 0653540 | 00000007 | 00002aff | 29540030 | 0002438a | 53100000 | 03003287 | 4b8c0000 | 0000446f | 537055f0 | 671c5370 | 5d100000 | 02003ebf |
| 0653620 | 5fa05370 | 4960228c | 00000074 | 000a8cac | b27cb66c | 00000499 | 7fffffff | 000a8e4c | 02000ce5 | 020031ed | 020031e5 | 000043af |
| 0653700 | 02000a3d | 02003645 | 0000262f | 0000000c | 02000885 | 00004107 | 00000010 | 020031f5 | 02003ebd | 00000014 | 0100262d | 00000018 |
| 0653760 | 02000885 | 00000012 | 03003ebd | 00000016 | 0000000e | 0000001a | 00002aff | 000a8f24 | 00000038 | b27cb66c | 0000049a | 000004c6 |
| 0654040 | 000a8f28 | 02000ce5 | 05001b01 | 000043af | 0000001b | 00002c07 | 006d1983 | 000002a3 | 00002aff | 27f00088 | 000a8e80 | 5d100000 |
| 0654120 | 03003287 | 4b8c0000 | 000043af | 64205818 | 67ec001c | 55f0682c | 537056f8 | 671c5370 | 5d100000 | 020031f7 | 61100018 | 5d100000 |
| 0654200 | 02003ebf | 671c58e0 | 0100262f | 67b85ec0 | 00000018 | 02000887 | 6d3c58e0 | 03003ebf | 6b74671c | 6c3436a4 | 476834e0 | 00183678 |
| 0654260 | 001c35c8 | 43000000 | 0000262f | 000cc5cc | 0018386c | 3d302340 | 000cfed8 | 0000003c | 000a8d18 | b27cb66c | 0000049b | 7fffffff |
| 0654340 | 000a8eb8 | 02000ce5 | 020031ed | 020031e5 | 000043af | 00000007 | 02003ebd | 0000000c | 00000007 | 00002aff | 29540030 | 0002438a |
| 0654420 | 5d100000 | 03003287 | 4b8c0000 | 000043af | 537055f0 | 671c5370 | 5d100000 | 02003ebf | 5fa05370 | 4960228c | 00000070 | 000a8e4c |
| 0654500 | b27cb66c | 0000049c | 7fffffff | 000a8fe4 | 02000ce5 | 020031ed | 020031e5 | 000043b7 | 02000a3d | 02003645 | 0000353f | 0000000c |
| 0654560 | 02000885 | 0000438f | 00000010 | 020031f5 | 02003ebd | 00000014 | 0100353d | 00000018 | 02000885 | 00000012 | 02003ebd | 00000016 |
| 0654640 | 0000001a | 00002aff | 000a90bc | 00000038 | b27cb66c | 0000049d | 000004c7 | 000a90c0 | 02000ce5 | 05001b0d | 000043b7 | 0000001b |
| 0654720 | 00002c07 | 006d1a83 | 000002a3 | 00002aff | 27f00084 | 000a9018 | 5d100000 | 03003287 | 4b8c0000 | 000043b7 | 60cc56f8 | 671c55f0 |
| 0655000 | 682c5370 | 581867b8 | 53705c30 | 020031f7 | 6530001c | 5e540000 | 02003ebf | 67ec0018 | 5a180000 | 0100353f | 67b85ec0 | 0000001c |
| 0655060 | 02000887 | 6d3c58e0 | 02003ebf | 6c840018 | 6c3436a4 | 476834e0 | 0018362c | 320c42ac | 0000353f | 000cc5cc | 0018386c | 3d302340 |
| 0655140 | 000da24c | 0000003c | 000a8eb8 | b27cb66c | 0000049e | 7fffffff | 000a9050 | 02000ce5 | 020031ed | 020031e5 | 000043b7 | 00000007 |
| 0655220 | 02003ebd | 0000000c | 00000007 | 00002aff | 29540030 | 0002438a | 5d100000 | 03003287 | 4b8c0000 | 000043b7 | 537055f0 | 671c5370 |
| 0655300 | 5d100000 | 02003ebf | 5fa05370 | 4960228c | 00000070 | 000a8fe4 | b27cb66c | 0000049f | 7fffffff | 000a917c | 02000ce5 | 020031ed |
| 0655360 | 020031e5 | 000043bf | 02000a3d | 02003645 | 00003447 | 0000000c | 02000885 | 00003b3f | 00000010 | 020031f5 | 02003ebd | 00000014 |
| 0655440 | 01003445 | 00000018 | 02000885 | 00000012 | 02003ff5 | 00000016 | 0000001a | 00002aff | 000a9234 | 00000038 | b27cb66c | 000004a0 |
| 0655520 | 000004c8 | 000a9238 | 02000ce5 | 05001b0d | 000043bf | 0000001b | 00002c07 | 006d1b83 | 000002a3 | 00002aff | 27f00084 | 000a91b0 |
| 0655600 | 5d100000 | 03003287 | 4b8c0000 | 000043bf | 60cc56f8 | 671c55f0 | 682c5370 | 581867b8 | 53705c30 | 020031f7 | 6530001c | 5e540000 |
| 0655660 | 02003ebf | 67ec0018 | 5a180000 | 01003447 | 67b85ec0 | 0000001c | 02000887 | 6d3c58e0 | 02003ff7 | 6c840018 | 6c3436a4 | 476834e0 |
| 0655740 | 0018362c | 320c42ac | 00003447 | 000cc5cc | 0018386c | 3d302340 | 000d72f4 | 0000003c | 000a9050 | b27cb66c | 000004a1 | 7fffffff |
| 0656020 | 000a9334 | 02000ce5 | 020031ed | 020031e5 | 000043bf | 00000007 | 02003ebd | 0000000c | 00000007 | 00002aff | 29540030 | 0002438a |
| 0656100 | 5d100000 | 03003287 | 4b8c0000 | 000043bf | 537055f0 | 671c5370 | 5d100000 | 02003ebf | 5fa05370 | 4960228c | 00000050 | 000c16c8 |
| 0656160 | b27cb66c | 000004a2 | 7fffffff | 000a92b0 | 02000ce5 | 020031e5 | 0100371d | 0000000c | 02000a3d | 010040b5 | 00000010 | 02000a3d |
| 0656240 | 0000083f | 01002d65 | 01003a9d | 01003a4d | 0000000e | 00002aff | 000a9398 | 00000038 | b27cb66c | 000004a3 | 000004c9 | 000a939c |
| 0656320 | 02000ce5 | 05001b0d | 0000371f | 00000023 | 00002c07 | 00664603 | 000002a3 | 00002aff | 27f00040 | 000a92ec | 45b85b58 | 03003287 |
| 0656400 | 61605370 | 5d7c0000 | 0100371f | 6d0c56f8 | 67505370 | 31f0247c | 000cf990 | 00102ecc | 447c0000 | 01003a4f | 6d0c234c | 000c87a0 |
| 0656460 | 00000044 | 000a91e8 | b27cb66c | 000004a4 | 7fffffff | 000e4af8 | 02000ce5 | 020031e5 | 0100371d | 0000000c | 02000a3d | 00000007 |
| 0656540 | 01002d65 | 01003a9d | 01003a45 | 0000000e | 00002aff | 29540040 | 0002438a | 36f40018 | 5d7c0000 | 03003287 | 61605370 | 5d7c0000 |
| 0656620 | 0100371f | 6c480018 | 56f85370 | 5370359c | 49c043c0 | 01003a47 | 6c480018 | 239c0000 | 000c87a0 | 00000068 | 000a917c | b27cb66c |
| 0656700 | 000004a5 | 7fffffff | 000a9448 | 02000ce5 | 020031ed | 020031e5 | 000040ef | 02000a3d | 0100368d | 0000000c | 02000885 | 00003b3f |
| 0656760 | 00000010 | 020031f5 | 02003ff5 | 00000014 | 00000018 | 02000885 | 00000012 | 02003ff5 | 00000016 | 0000001a | 00002aff | 000a94b0 |
| 0657040 | 00000038 | b130b66c | 000004a6 | 000004ca | 000aed71 | 02000ce5 | 05001b0d | 000040ef | 0000001b | 00002c07 | 0067dea3 | 000002a3 |
| 0657120 | 00002aff | 27f00074 | 000a947c | 5d100000 | 03003287 | 4b8c0000 | 000040ef | 60cc56f8 | 671c55f0 | 682c5370 | 581867b8 | 53705c30 |
| 0657200 | 020031f7 | 6530001c | 5e540000 | 02003ff7 | 66700018 | 5c9c001c | 02000887 | 6d3c58e0 | 02003ff7 | 6c840018 | 6c344768 | 344c3640 |
| 0657260 | 35c831f0 | 24d00000 | 000da4c4 | 0018386c | 33302340 | 000d72f4 | 0000003c | 000a9334 | b27cb66c | 000004a7 | 7fffffff | 000d8248 |
| 0657340 | 02000ce5 | 020031ed | 020031e5 | 000040ef | 00000007 | 02003ff5 | 0000000c | 00000007 | 00002aff | 29540030 | 0002438a | 5d100000 |
| 0657420 | 03003287 | 4b8c0000 | 000040ef | 537055f0 | 671c5370 | 5d100000 | 02003ff7 | 5fa05370 | 4960228c | 000a9710 | 00000040 | 00000000 |
| 0657500 | 000db1fc | 00000000 | 000db0ac | 000db215 | 000db184 | 00000000 | 00000000 | 00000000 | 00000000 | 000dafbc | 000daf41 | 00000000 |
| 0657560 | 00000000 | 000000bc | 000dd3c0 | b27cb66c | 00000532 | 7fffffff | 000a96b8 | 02000ce5 | 020031ed | 020031e5 | 000045e7 | 02000a3d |
| 0657640 | 02003645 | 0000000c | 00000010 | 02000a3d | 010036d5 | 00000014 | 02000a3d | 02000885 | 00003b3f | 00000018 | 02000a3d | 02000885 |
| 0657720 | 000042b7 | 0000001c | 010036dd | 00000020 | 020031f5 | 0200412d | 00000024 | 02003ca5 | 0000000e | 00000001 | 00000028 | 0000002c |
| 0660000 | 02000a3d | 02000885 | 0000001a | 02003ff5 | 00000026 | 0000002a | 02000885 | 0000001e | 02003ff5 | 00000026 | 0000002e | 00002aff |
| 0660060 | 29540108 | 0002438a | 5d100000 | 03003287 | 4b8c0000 | 000045e7 | 64205818 | 67ec001c | 55f0687c | 002855f0 | 6af00020 | 55f06aa0 |
| 0660140 | 55f069b0 | 537056f8 | 671c5370 | 5d100000 | 020031f7 | 61100020 | 5d100000 | 0200412f | 67ec0018 | 5a180000 | 02003ca7 | 671c55f0 |
| 0660220 | 66700024 | 5c9c0020 | 02000a3f | 66c00028 | 00205ec0 | 00000028 | 02000887 | 6e580020 | 5a180000 | 02003ff7 | 6c840018 | 6c840024 |
| 0660300 | 5c9c0020 | 02000887 | 6e0858e0 | 02003ff7 | 6c840018 | 6c3436a4 | 47683540 | 0018002c | 3678001c | 320c247c | 000cc5cc | 003034a0 |
| 0660360 | 00243eec | 002c382c | 002831f0 | 24d00000 | 000cf098 | 00283410 | 001c3e70 | 00243c9c | 00000020 | 000d72f4 | 002033bc | 3e70001c |
| 0660440 | 3c480000 | 000d76e4 | 001838d4 | 3d6037dc | 31f0234c | 000cf0d8 | 0000005c | 000a94f4 | b27cb66c | 00000533 | 7fffffff | 000a97a4 |

| | | | | | | | | | | | | |
|---|---|---|---|---|---|---|---|---|---|---|---|---|
| 0660520 | 02000ce5 | 020031ed | 020031e5 | 000045ef | 02000885 | 00004457 | 0000000c | 020031f5 | 0200412d | 00000010 | 00000014 | 02000885 |
| 0660600 | 0000000e | 0200412d | 00000012 | 00000016 | 00002aff | 000a9aa8 | 00000038 | b27cb66c | 00000534 | 00000560 | 000a9aac | 02000ce5 |
| 0660660 | 05001b0d | 000045ef | 0000001b | 00002c07 | 00701223 | 000002b3 | 00002aff | 27f00058 | 000a97e0 | 5d100000 | 03003287 | 4b8c0000 |
| 0660740 | 000045ef | 60cc56f8 | 671c5370 | 581867b8 | 53705c30 | 020031f7 | 6530001c | 5e540000 | 0200412f | 66700018 | 5c9c001c | 02000887 |
| 0661020 | 6b7458e0 | 0200412f | 6c840018 | 6c3422bc | 000dad8c | 00000044 | 000a96b8 | b27cb66c | 00000535 | 7fffffff | 000a9830 | 02000ce5 |
| 0661100 | 020031ed | 020031e5 | 000045ef | 02003645 | 0000000c | 00000010 | 0200412d | 00000014 | 0000000e | 00002aff | 28c40048 | 000a986c |
| 0661160 | 5d100000 | 03003287 | 4b8c0000 | 000045ef | 64205818 | 67ec001c | 537056f8 | 671c5370 | 5d100000 | 0200412f | 5fa0671c | 36a43724 |
| 0661240 | 00183678 | 001c320c | 239c0000 | 000cc5cc | 00000044 | 000a97a4 | b27cb66c | 00000536 | 7fffffff | 000a98bc | 02000ce5 | 020031ed |
| 0661320 | 020031e5 | 000045ef | 02003755 | 0000000c | 00000010 | 0200412d | 00000014 | 0000000e | 00002aff | 28c40048 | 000a98f8 | 5d100000 |
| 0661400 | 03003287 | 4b8c0000 | 000045ef | 64205818 | 67ec001c | 537056f8 | 671c5370 | 5d100000 | 0200412f | 5fa0671c | 36a43724 | 00183678 |
| 0661460 | 001c320c | 239c0000 | 000d803c | 00000044 | 000a9830 | b27cb66c | 00000537 | 7fffffff | 000a9948 | 02000ce5 | 020031ed | 020031e5 |
| 0661540 | 000045ef | 02003765 | 0000000c | 00000010 | 0200412d | 00000014 | 0000000e | 00002aff | 28c40048 | 000a9984 | 5d100000 | 03003287 |
| 0661620 | 4b8c0000 | 000045ef | 64205818 | 67ec001c | 537056f8 | 671c5370 | 5d100000 | 0200412f | 5fa0671c | 36a43724 | 00183678 | 001c320c |
| 0661700 | 239c0000 | 000cf1c8 | 00000044 | 000a98bc | b27cb66c | 00000538 | 7fffffff | 000a99d8 | 02000ce5 | 020031ed | 020031e5 | 000045ef |
| 0661760 | 02003645 | 00001aff | 0000000c | 0200412d | 00000010 | 00001aff | 00002aff | 2954004c | 0002438a | 5d100000 | 03003287 | 4b8c0000 |
| 0662040 | 000045ef | 60cc56f8 | 671c5370 | 581867b8 | 53705c30 | 0200412f | 5fa04af8 | 00001aff | 36a43724 | 0018362c | 320c41d4 | 00001aff |
| 0662120 | 239c0000 | 000cc5cc | 000000d4 | 000a9948 | b27cb66c | 00000539 | 7fffffff | 000a9c0c | 02000ce5 | 020031ed | 020031e5 | 000045d7 |
| 0662200 | 02000a3d | 02000885 | 000045e7 | 0000000c | 02000a3d | 010036d5 | 00000010 | 02000a3d | 02000885 | 00003b3f | 00000014 | 02000a3d |
| 0662260 | 02000885 | 000042b7 | 00000018 | 010036dd | 0000001c | 020031f5 | 0200412d | 00000020 | 02003ca5 | 00000024 | 00000001 | 00000028 |
| 0662340 | 0000002c | 02000a3d | 02000885 | 0000000e | 0200412d | 00000022 | 00000026 | 02000a3d | 02000885 | 00000016 | 02003ff5 | 00000022 |
| 0662420 | 0000002a | 02000885 | 0000001a | 02003ff5 | 00000022 | 0000002e | 00002aff | 000a9cac | 00000038 | b27cb66c | 0000053a | 00000561 |
| 0662500 | 000a9cb0 | 02000ce5 | 05001b0d | 000045d7 | 0000001b | 00002c07 | 00700723 | 000002b3 | 00002aff | 2c780128 | 0002438a | 5d100000 |
| 0662560 | 03003287 | 4b8c0000 | 000045d7 | 60cc56f8 | 671c55f0 | 687c0028 | 55f06af0 | 002055f0 | 6aa055f0 | 69b05370 | 581867b8 | 53705c30 |
| 0662640 | 020031f7 | 6530001c | 5e540000 | 0200412f | 67ec0018 | 5a180000 | 02003ca7 | 67ec0024 | 55f06670 | 00205ec0 | 0000001c | 02000a3f |
| 0662720 | 66c00028 | 001c5ec0 | 00000028 | 02000887 | 6b7458e0 | 0200412f | 6c840018 | 6c840024 | 5c9c001c | 02000a3f | 66c00024 | 001c5ec0 |
| 0663000 | 00000024 | 02000887 | 6e580020 | 5a180000 | 02003ff7 | 6c840018 | 6c840020 | 5c9c001c | 02000887 | 6e0858e0 | 02003ff7 | 6c840018 |
| 0663060 | 6c344768 | 3410002c | 24d00000 | 000e0224 | 003034a0 | 00243eec | 002c382c | 002831f0 | 24d00000 | 000cf098 | 00283410 | 001c3e70 |
| 0663140 | 00243c9c | 00000020 | 000d72f4 | 002033bc | 3e70001c | 3c480000 | 000d76e4 | 001838d4 | 3d6037dc | 31f0234c | 000cf0d8 | 000000a4 |
| 0663220 | 000a99d8 | b27cb66c | 0000053b | 7fffffff | 000a9dc4 | 02000ce5 | 020031ed | 020031e5 | 000045df | 02000a3d | 02000885 | 000045e7 |
| 0663300 | 0000000c | 02000a3d | 010036d5 | 00000010 | 02000a3d | 02000885 | 00004427 | 00000014 | 010036dd | 00000018 | 020031f5 | 0200412d |
| 0663360 | 0000001c | 02003cb5 | 00000020 | 00000024 | 02000a3d | 02000885 | 0000000e | 0200412d | 0000001e | 00000022 | 02000885 | 00000016 |
| 0663440 | 02004005 | 0000001e | 00000026 | 00002aff | 000a9e44 | 00000038 | b27cb66c | 0000053c | 00000562 | 000a9e48 | 02000ce5 | 05001b0d |
| 0663520 | 000045df | 0000001b | 00002c07 | 00700b83 | 000002b3 | 00002aff | 2c7800dc | 0002438a | 5d100000 | 03003287 | 4b8c0000 | 000045df |
| 0663600 | 60cc56f8 | 671c55f0 | 687c0020 | 55f06aa0 | 55f069b0 | 53705818 | 67b85370 | 5e540000 | 020031f7 | 6530001c | 5e540000 | 0200412f |
| 0663660 | 67ec0018 | 5a180000 | 02003cb7 | 66700020 | 5c9c001c | 02000a3f | 66c00024 | 001c5ec0 | 00000024 | 02000887 | 6b7458e0 | 0200412f |
| 0663740 | 6c840018 | 6c840020 | 5c9c001c | 02000887 | 6e0858e0 | 02004007 | 6c840018 | 6c344768 | 34100024 | 24d00000 | 000e0224 | 002834a0 |
| 0664020 | 001c3eec | 0024382c | 002031f0 | 24d00000 | 000cf098 | 002033bc | 3e70001c | 3c480000 | 000da91c | 001838d4 | 3d6037dc | 31f0234c |
| 0664100 | 000cf0d8 | 00000084 | 000a9c0c | b27cb66c | 0000053d | 7fffffff | 000aa024 | 02000ce5 | 020031ed | 020031e5 | 00004577 | 02000a3d |
| 0664160 | 02000885 | 000045e7 | 0000000c | 02000a3d | 010036cd | 00000010 | 02003645 | 00000014 | 00000019 | 020031f5 | 0200412d | 0000001c |
| 0664240 | 030043e5 | 00000020 | 00000016 | 00000007 | 02000885 | 0000000e | 0200412d | 0000001e | 00000022 | 00002aff | 000aa208 | 00000138 |
| 0664320 | b130b66c | 0000053e | 00000563 | 000db565 | 02000ce5 | 05001b0d | 00004577 | 0000001b | 00002c07 | 006fd343 | 000002b3 | 00002aff |
| 0664400 | 000a9ebc | 00000040 | 00000000 | 00000000 | 00000000 | 00000000 | 00000000 | 000e0048 | 00000000 | 00000000 | 000da54d | 000e03e8 |
| 0664460 | 000e0288 | 000e02f0 | 000e042c | 000e00c4 | 000aa208 | 000000c0 | 00000000 | 00000000 | 00000000 | 00000000 | 00000000 | 00000000 |
| 0664540 | 00000000 | 000d7e2c | 000dac24 | 000dff10 | 000daca4 | 00000000 | 000dab9c | 000db04d | 00000000 | 000da970 | 00000000 | 000da7f0 |
| 0664620 | 00000000 | 000da6bc | 00000000 | 000d7b00 | 000da784 | 000dfb9c | 000dfd9c | 000c920c | 000da53c | 000d7d9c | 000e042c | 000dfb08 |
| 0664700 | 000dfc18 | 00000000 | 000dfce8 | 000dfe20 | 000dfe84 | 00000000 | 00000000 | 000e0048 | 00000000 | 00000000 | 000e03a4 | 000e03e8 |
| 0664760 | 000e0288 | 000e02f0 | 00000000 | 00000000 | 27f000a4 | 000aa0e0 | 5d100000 | 03003287 | 4b8c0000 | 00004577 | 60cc56f8 | 671c55f0 |
| 0665040 | 6d7c001c | 55f06a00 | 53705818 | 67b85370 | 5e540000 | 020031f7 | 6530001c | 5e540000 | 0200412f | 67ec0018 | 5a180000 | 030043e7 |
| 0665120 | 67b869b0 | 53705ec0 | 0000001c | 02000887 | 6b7458e0 | 0200412f | 6c840018 | 6c34477c | 34100020 | 24d00000 | 000e0224 | 00243468 |
| 0665200 | 3eec0020 | 382c001c | 31f0247c | 000d79c0 | 001c3968 | 00183d9c | 3858320c | 24200000 | 000cc5cc | 000000c4 | 000a9dc4 | b27cb66c |
| 0665260 | 0000053f | 7fffffff | 000d728 | 02000ce5 | 020031ed | 020031e5 | 00004577 | 02000a3d | 02000885 | 000045e7 | 0000000c | 02000a3d |
| 0665340 | 010036cd | 00000010 | 02000a3d | 02003645 | 00000014 | 00000018 | 02000a3d | 010036d5 | 0000001c | 02000a3d | 02000885 | 00003b3f |
| 0665420 | 00000020 | 010036dd | 00000024 | 020031f5 | 0200412d | 00000028 | 030043e5 | 0000002c | 00000016 | 00000030 | 02000a3d | 02000885 |
| 0665500 | 0000000e | 0200412d | 0000002a | 0000002e | 02000885 | 00000022 | 02003ff5 | 0000002a | 00000032 | 00002aff | 29540124 | 0002439a |
| 0665560 | 5d100000 | 03003287 | 4b8c0000 | 00004577 | 60cc56f8 | 671c55f0 | 687c0034 | 55f06af0 | 002c55f0 | 6af00020 | 55f06aa0 | 55f069b0 |

| | | | | | | | | | | | | |
|---|---|---|---|---|---|---|---|---|---|---|---|---|
| 0665640 | 53705818 | 67b85370 | 5e540000 | 020031f7 | 6510001c | 5e540000 | 0200412f | 67ec0018 | 5a180000 | 030043e7 | 67ec0020 | 6af00028 |
| 0665720 | 67b85ec0 | 0000001c | 02000a3f | 66c00024 | 001c5ec0 | 00000024 | 02000887 | 6b7458e0 | 0200412f | 6c840018 | 6c840020 | 5c9c001c |
| 0666000 | 02000887 | 6e0858e0 | 02003ff7 | 6c840018 | 6c344768 | 34100038 | 24d00000 | 000e0224 | 003c34a0 | 00303eec | 0038382c | 003431f0 |
| 0666060 | 24d00000 | 000d79c0 | 00343540 | 00180024 | 3f680030 | 3894002c | 320c3c9c | 00000028 | 000cc5cc | 002834a0 | 001c3eec | 0024382c |
| 0666140 | 002031f0 | 24d00000 | 000cf098 | 002033bc | 3e70001c | 3c880000 | 000d72f4 | 001838d4 | 3d6037dc | 31f0234c | 000cf0d8 | 000aaab4 |
| 0666220 | 00000758 | 00000000 | 00000000 | 000dfc7c | 00000000 | 00000000 | 00000000 | 00000000 | 00000000 | 000da129 | 000e0004 | 00000000 |
| 0666300 | 00000000 | 000e042c | 00000000 | 00000000 | 00000000 | 000dfce8 | 000dfe20 | 000dfe84 | 00000000 | 00000000 | 000e0048 | 00000000 |
| 0666360 | 00000000 | 000e03a4 | 000daf39 | 000e0288 | 000e02f0 | 00000000 | 000e00c4 | 000aaab4 | 000006d8 | 000a927d | 000aa299 | 000aa27e |
| 0666440 | 02000a57 | 000a97c9 | 000a92b9 | 000aa2ad | 000aa292 | 02000a57 | 000a97ed | 000a92f5 | 000aa2c1 | 000aa2a6 | 02000a57 | 000a9811 |
| 0666520 | 000a91fd | 000aa2d5 | 000aa2ba | 02000a57 | 000a9835 | 000a93a1 | 000aa2e9 | 000aa2ce | 02000a57 | 000a9855 | 000a93dd | 000aa2fd |
| 0666600 | 000aa2e2 | 02000a57 | 000a9879 | 000a9321 | 000aa311 | 000aa2f6 | 02000a57 | 000a989d | 000a8bc9 | 01002647 | 0000000b | 0100261f |
| 0666660 | 0000001b | 01002647 | 0000001b | 0000000b | 000aa32d | 0000000b | 000aa345 | 01002647 | 00000013 | 0100261f | 0000002b | 01002647 |
| 0666740 | 00000023 | 0000000b | 000aa355 | 02000a57 | 000a9425 | 000a8cd9 | 00000013 | 000aa355 | 00000013 | 000aa381 | 000006df | 0000022b |
| 0667020 | 000aa38e | 0000036b | 000aa396 | 0000030b | 000aa39e | 0000031b | 000aa3a6 | 0000039b | 000aa3ae | 000001d3 | 000aa3b6 | 0000017b |
| 0667100 | 000aa3be | 000003a3 | 000aa3c6 | 0000036b | 000aa3ce | 00000383 | 000aa3d6 | 0000017b | 000aa3de | 0000028b | 000aa3e6 | 00000283 |
| 0667160 | 000aa3ee | 00000393 | 000aa3f6 | 0000037b | 000aa3fe | 00000363 | 000aa406 | 0000037b | 000aa40e | 0000033b | 000aa416 | 00000193 |
| 0667240 | 000aa41e | 000001bb | 000aa426 | 000001b3 | 000aa42e | 000001b3 | 00000007 | 000001d3 | 00000007 | 0000039b | 000aa436 | 0000031b |
| 0667320 | 000aa43e | 0000030b | 000aa446 | 0000036b | 000aa44e | 0000022b | 000aa456 | 0100092f | 000030c7 | 0000000b | 0000092f | 02000a57 |
| 0667400 | 0000001f | 00000007 | 02000ce7 | 000aa465 | 00002aff | 004d2503 | 000aa499 | 000aa4a2 | 01002a27 | 0000002b | 00000fff | 000aa4aa |
| 0667460 | 0000001f | 000aa4b2 | 000aa4b9 | 00000007 | 01002a27 | 00000083 | 01002a27 | 00000033 | 01002a27 | 0000007b | 03002427 | 000aa492 |
| 0667540 | 000aa4c1 | 000aa4c9 | 000aa4c9 | 00000007 | 000aa4c1 | 000aa4e2 | 000aa492 | 000aa4ea | 00001dff | 000aa4f2 | 02001f77 | 00002787 |
| 0667620 | 000030cf | 00000013 | 00001f77 | 01002c37 | 00002c07 | 02000a57 | 0000004f | 00000007 | 02000ce7 | 000aa515 | 00002aff | 004d2903 |
| 0667700 | 02000a57 | 00002c07 | 00000007 | 02000ce7 | 000aa501 | 00002aff | 004d2c63 | 02001f77 | 0000283f | 000006df | 02000a57 | 00002c07 |
| 0667760 | 00000007 | 02000ce7 | 000aa555 | 00002aff | 004d2c63 | 01001eaf | 004d2c63 | 0000039b | 000aa58e | 000003ab | 000aa596 | 00000373 |
| 0670040 | 000aa59e | 000001a3 | 000aa5a6 | 0000016b | 000aa5ae | 000001a3 | 000aa5b6 | 00000173 | 000aa5be | 00000183 | 00000007 | 00002bbf |
| 0670120 | 000030e7 | 00004e73 | 00000193 | 000aa5da | 00000173 | 000aa5e2 | 000001ab | 00000007 | 000030ef | 000aa62a | 00000173 | 000aa5be |
| 0670200 | 0000039b | 000aa602 | 000003ab | 000aa60a | 00000373 | 000aa612 | 000001a3 | 000aa61a | 0000016b | 000aa622 | 000001a3 | 00000007 |
| 0670260 | 000030f7 | 000aa65a | 0000016b | 000aa622 | 0000039b | 000aa642 | 000001ab | 000aa64a | 00000373 | 000aa652 | 000001a3 | 00000007 |
| 0670340 | 000006df | 00000007 | 00003047 | 000aa5ea | 02001f77 | 00002a17 | 000030d7 | 02000a57 | 00002c07 | 00000007 | 02000ce7 | 000aa669 |
| 0670420 | 00002aff | 004d2c63 | 01001eaf | 004d2c63 | 02001f77 | 00002a17 | 000030ef | 02000a57 | 00002c07 | 00000007 | 02000ce7 | 000aa699 |
| 0670500 | 00002aff | 004d2c63 | 01001eaf | 004d2c63 | 02001f77 | 00002a17 | 000030f7 | 02000a57 | 00002c07 | 00000007 | 02000ce7 | 000aa6c9 |
| 0670560 | 00002aff | 004d2c63 | 01001eaf | 004d2c63 | 02001f77 | 00002a17 | 000006df | 02000a57 | 00002c07 | 00000007 | 02000ce7 | 000aa6f9 |
| 0670640 | 00002aff | 004d2c63 | 01001eaf | 004d2c63 | 0000038b | 00000007 | 0000038b | 000aa5d2 | 00002127 | 00000007 | 000030ff | 000aa73a |
| 0670720 | 0000038b | 000aa752 | 00000193 | 000aa75a | 00000173 | 000aa762 | 000001ab | 00000007 | 0000017b | 000aa74a | 0000017b | 000aa77a |
| 0671000 | 0000038b | 000aa782 | 00000193 | 000aa78a | 00000173 | 000aa792 | 000001ab | 000aa7da | 00000343 | 000aa7a2 | 0000032b | 000aa7aa |
| 0671060 | 00000363 | 000aa7b2 | 00000383 | 000aa7ba | 0000039b | 000aa7c2 | 000003cb | 000aa7ca | 0000039b | 00000007 | 0000017b | 000aa79a |
| 0671140 | 0000017b | 000aa7e2 | 00000343 | 000aa7ea | 0000032b | 000aa7f2 | 00000361 | 000aa7fa | 00000383 | 000aa802 | 0000039b | 000aa80a |
| 0671220 | 000003cb | 000aa812 | 0000039b | 00000007 | 0000033b | 000aa822 | 0000032b | 000aa82a | 00000373 | 000aa832 | 0000032b | 000aa83a |
| 0671300 | 00000393 | 000aa842 | 0000034b | 000aa84a | 0000031b | 00000007 | 0000033b | 000aa85a | 0000032b | 000aa862 | 00000373 | 000aa86a |
| 0671360 | 0000032b | 000aa872 | 00000393 | 000aa87a | 0000034b | 000aa882 | 0000031b | 000aa772 | 01002787 | 00003107 | 02001f77 | 00002127 |
| 0671440 | 000aa889 | 02000a57 | 00002c07 | 00000007 | 02000ce7 | 000aa891 | 00002aff | 004d2c63 | 01001eaf | 004d2c63 | 00000313 | 00000007 |
| 0671520 | 0000034b | 000aa8c2 | 00000363 | 000aa8ca | 00000383 | 000aa8d2 | 0000038b | 000aa8da | 0000038b | 000aa8f2 | 00000383 | 000aa8fa |
| 0671600 | 00000363 | 000aa902 | 0000034b | 000aa90a | 00000313 | 000aa5d2 | 0000310f | 00000007 | 0000034b | 000aa922 | 00000383 | 000aa92a |
| 0671660 | 00000363 | 000aa932 | 0000034b | 000aa93a | 00000313 | 000aa942 | 00000193 | 000aa94a | 00000173 | 000aa952 | 000001ab | 00000007 |
| 0671740 | 0000017b | 000032a7 | b328cbe9 | 0009f0a4 | 00000000 | 000032bf | b328e92d | 000a8a28 | 00000000 | 000acadc | 28c40028 | 0009f2ec |
| 0672020 | 4e1c0000 | 00000007 | 57b85370 | 6b885ec0 | 0000001c | 02000d27 | 6c086c48 | 00182edc | ffffffff | 02001cf7 | 00002c07 | 00000008 |
| 0672100 | 000a8be8 | 000a8be8 | 00010042 | 00000000 | 2aa80393 | 000aa9d4 | 0009f35a | 2b24a9da | 0002438a | 0009f3ba | 28c4001e | 0009f3f8 |
| 0672160 | 53100000 | 01002d67 | 671c4960 | 4a480018 | 4a00001c | 2edcaa02 | 00003a2f | b3280000 | 000b0cdc | 00000000 | 000aa98c | 00000000 |
| 0672240 | 0009f0e4 | 00000000 | 0009f404 | 000aaa18 | 000a4799 | 00000000 | 00000000 | 00000000 | 000aa9ec | 00000000 | 00000000 | 000aaa21 |
| 0672320 | 00087462 | 6f64792e | 706c0000 | 29540014 | 0002438a | 56f85fa0 | 671c22bc | 000b0b9c | 2b240000 | 0002438a | 000a8b90 | 28c40012 |
| 0672400 | 000b4de0 | 4e1c0000 | 000033b7 | 228ccc58 | 0003616e | 64002c75 | 0007f8dc | 0300312f | 00002c07 | 0000000c | 000b4cec | 000b4cec |
| 0672460 | 00010046 | 00000000 | 000aaba4 | C0000058 | b288b66c | 0000008c | 7fffffff | 000acb18 | 02000ce5 | 0100147d | 01002d65 | 0000000b |
| 0672540 | 00002aff | 000aaba4 | 0000002c | b288b66c | 0000008c | 7fffffff | 000aaab8 | 02000ce5 | 0100147d | 01002d65 | 0000000b | 00002aff |
| 0672620 | 00302f68 | 6f6d652f | 6f736173 | 312f612f | 73726565 | 2f70726f | 6c6f672d | 74726961 | 6c732f64 | 6374672f | 64637467 | 312f6c69 |
| 0672700 | 73740061 | 00332f68 | 6f6d652f | 6f736173 | 312f612f | 73726565 | 2f70726f | 6c6f672d | 74726961 | 6c732f64 | 6374672f | 64637467 |

```
0672760  312f6c69 73742e70 6c006d65 0000002c 000acbdc b27cb66c 0000008e 7fffffff 000a9a24 02000ce5 0200293d 000032d7
0673040  0000021b 00002aff 000aac50 0000002c b288b66c 0000008d 7fffffff 000aab7c 02000ce5 0100147d 01002d65 0000000b
0673120  00002aff 0000002c 0009cd50 b27cb66c 000001d4 7fffffff 0009d178 02000ce5 02001f6d 000039c7 00002c07 00002aff
0673200  000f666f 756e645f 73656d69 636f6c6f 6e000000 0000002c 000acc34 b27cb66c 00000094 7fffffff 000a8a7c 02000ce5
0673260  02001f6d 000032d7 00002c07 00002aff 28c40012 000aaa54 56f8671c 5fa048f8 228c0000 000acb14 00001e6c b27cb66c
0673340  00000090 00000093 0009cbc1 02000ce5 02002385 000032d7 00002c07 00002aff 000aacb4 00000038 b130b66c 00000091
0673420  00000095 000aacb9 02000ce5 05001b0d 00002327 00000013 00002c07 005448e3 0000021b 00002aff 000aace0 0000002c
0673500  b4f0b4e4 00000090 7fffffff 0007eaad 00000000 00000000 000aac80 0002438a 000a46e4 000acb14 00001ddc 000aacea
0673560  00000393 000aacf2 000002fb 000aacfa 00000363 000aad02 0000037b 000aad0a 0000030b 000aad12 00000323 000aad1a
0673640  000002fb 000aad22 0000031b 000aad2a 0000037b 000aad32 00000323 000aad3a 0000032b 00000007 000aacb1 000aad4a
0673720  0000098f 000aad92 01001b97 00001d7f 0000031b 000aad62 0000037b 000aad6a 00000373 000aad72 0000039b 000aad7a
0674000  000003ab 000aad82 00000363 000aad8a 000003a3 00000007 000aad51 000aad9a 00000a3f 000aaefa 01001b97 0000312f
0674060  0000017b 000aadb2 00000343 000aadba 0000037b 000aadc2 0000036b 000aadca 0000032b 000aadd2 0000017b 000aadda
0674140  0000037b 000aade2 0000039b 000aadea 0000030b 000aadf2 0000039b 000aadfa 0000018b 000aae02 0000017b 000aae0a
0674220  0000030b 000aae12 0000017b 000aae1a 0000039b 000aae22 00000393 000aae2a 0000032b 000aae32 0000032b 000aae3a
0674300  0000017b 000aae42 0000039b 000aae4a 0000032b 000aae52 0000036b 000aae5a 0000030b 000aae62 00000373 000aae6a
0674360  000003a3 000aae72 0000034b 000aae7a 0000031b 000aae82 000002fb 000aae8a 0000031b 000aae92 00000343 000aae9a
0674440  0000032b 000aaea2 0000031b 000aaeaa 0000035b 000aaeb2 0000018b 000aaeba 0000017b 000aaec2 0000036b 000aaeca
0674520  0000030b 000aaed2 0000034b 000aaeda 00000373 000aaee2 00000173 000aaeea 00000383 000aaef2 00000363 00000007
0674600  000aada1 000aaf02 000009ff 00000007 00000a3f 000aaefa 0000312f 00000007 000009ff 00000007 00001d7f 000aaf12
0674660  00000927 000aaf22 02000927 00001d7f 0000312f 00002aff 0100092f 000030c7 02000ce7 000aaf41 00002aff 02000ce7
0674740  000aaf61 00002aff 0100092f 000030c7 01002b4f 00002c07 02000ce7 000aaf69 00002aff 02000ce7 000aaf89 00002aff
0675020  01002b4f 00002c07 00001d2b 000aaf9a 00000323 00000007 001399e3 000aafaa 00006423 00000007 0000017b 000aafba
0675100  000003a3 000aafc2 0000036b 000aafca 00000383 000aafd2 0000017b 000aafda 0000028b 000aafe2 00000281 000aafea
0675160  00000393 000aaff2 0000037b 000aaffa 00000363 000ab002 0000037b 000ab00a 0000033b 000ab012 00000193 000ab01a
0675240  000001bb 000ab022 000001b3 000ab02a 000001b3 00000007 0000017b 000aafda 000ab03e 0000017b 000ab046 000003a3
0675320  000ab04e 0000036b 000ab056 00000383 00000007 0200095f 00000013 0000001b 0200293f 0000312f 000001db 00000013
0675400  0000293f 02000a57 00000057 00000007 02000ce7 000ab069 00002aff 004e5443 0000017b 000ab0a2 00000343 000ab0aa
0675460  0000037b 000ab0b2 0000036b 000ab0ba 0000032b 000ab0c2 0000017b 000ab0ca 0000037b 000ab0d2 0000039b 000ab0da
0675540  0000030b 000ab0e2 0000039b 000ab0ea 0000018b 000ab0f2 0000017b 000ab0fa 0000030b 000ab102 0000017b 000ab10a
0675620  0000039b 000ab112 00000393 000ab11a 0000032b 000ab122 0000032b 000ab12a 0000017b 000ab132 0000039b 000ab13a
0675700  0000032b 000ab142 0000036b 000ab14a 0000030b 000ab152 00000373 000ab15a 000003a3 000ab162 0000034b 000ab16a
0675760  0000031b 000ab172 000002fb 000ab17a 0000031b 000ab182 00000343 000ab18a 0000032b 000ab192 0000031b 000ab19a
0676040  0000035b 000ab1a2 0000018b 000ab1aa 0000017b 000ab1b2 0000036b 000ab1ba 0000030b 000ab1c2 0000034b 000ab1ca
0676120  00000373 000ab1d2 00000173 000ab1da 00000383 000ab1e2 00000363 00000007 0000017b 000ab1b2 0000017b 000ab1fa
0676200  00000343 000ab202 0000037b 000ab20a 0000036b 000ab212 0000032b 000ab21a 0000017b 000ab222 0000037b 000ab22a
0676260  0000039b 000ab232 0000030b 000ab23a 0000039b 000ab242 0000018b 000ab24a 0000017b 000ab252 0000030b 000ab25a
0676340  0000017b 000ab262 0000039b 000ab26a 00000393 000ab272 0000032b 000ab27a 0000032b 000ab282 0000017b 000ab28a
0676420  0000039b 000ab292 0000032b 000ab29a 0000036b 000ab2a2 0000030b 000ab2aa 00000373 000ab2b2 000003a3 000ab2ba
0676500  0000034b 000ab2c2 0000031b 000ab2ca 000002fb 000ab2d2 0000031b 000ab2da 00000343 000ab2e2 0000032b 000ab2ea
0676560  0000031b 000ab2f2 0000035b 000ab2fa 0000018b 00000007 0500236f 00001d7f 00001e87 000001db 000ab05d 0000313f
0676640  02000a57 00000057 00000007 02000ce7 000ab301 00002aff 004e5983 00000007 10002c4f 000ab13c 000ab340 000ab344
0676720  000ab348 000ab34c 000ab350 000ab354 000ab358 000ab35c 000ab360 000ab364 000ab368 000ab36c 000ab370 000ab374
0677000  000ab378 01001b97 00000ce7 000ab37d 000ab396 01001b97 00001d57 000ab38d 000ab39e 0000098f 000ab4a6 01001b97
0677060  00003147 000003f3 000ab3b6 0000017b 000ab3be 00000393 000ab3c6 00000393 000ab3ce 0000037b 000ab3d6 00000363
0677140  000ab3de 0000037b 000ab3e6 0000033b 000ab3ee 0000016b 000ab3f6 000003a3 000ab3fe 00000393 000ab406 0000034b
0677220  000ab40e 0000030b 000ab416 00000363 000ab41e 0000039b 000ab426 0000017b 000ab42e 00000323 000ab436 0000031b
0677300  000ab43e 000003a3 000ab446 0000033b 000ab44e 0000017b 000ab456 00000323 000ab45e 0000031b 000ab466 000003a3
0677360  000ab46e 0000033b 000ab476 0000018b 000ab47e 0000017b 000ab486 0000036b 000ab48e 0000030b 000ab496 0000034b
0677440  000ab49e 00000373 00000007 000ab3a5 000ab4ae 000009ff 00000007 03002c3f 00000ce7 00002583 0000203f 02000ce7
0677520  000ab4b5 00002aff 02000ce7 000ab4dd 00002aff 03002c3f 00000ce7 00002583 0000203f 000009ff 00000007 00003147
0677600  00000007 00001d57 000ab4f6 01001d57 00003147 01000ce7 000ab505 02001f6f 0000312f 000ab51c 02002387 0000312f
0677660  000ab528 02002387 0000312f 00002c07 02000a57 00000057 00000007 02000ce7 000ab52d 00002aff 004e5c03 07002987
0677740  0000000b 00000003 00000003 00000003 00000003 00000003 0000000b 04002107 00001d57 0000000b 0000001f 00001c3f
0700020  02000ce7 000ab575 00002aff 02000ce7 000ab5a1 00002aff 04002107 00001d57 0000000b 0000001f 00001c3f 01001d57
```

| | | | | | | | | | | | | |
|---|---|---|---|---|---|---|---|---|---|---|---|---|
| 0700100 | 00000cdf | 020024af | 000ab5b5 | 0000001f | 02000ce7 | 000ab5bd | 00002aff | 02000ce7 | 000ab5e1 | 00002aff | 020024af | 000ab5ed |
| 0700160 | 0000001f | 01001d57 | 00000cdf | 01001d57 | 000ab5fd | 02000cdf | 00002c07 | 00003147 | 01001d57 | 000ab5fd | 000ab619 | 00000007 |
| 0700240 | 01001f67 | 00003147 | 00003157 | 00000007 | 0000017b | 000ab632 | 00000343 | 000ab63a | 0000037b | 000ab642 | 0000036b | 000ab64a |
| 0700320 | 0000032b | 000ab652 | 0000017b | 000ab65a | 0000037b | 000ab662 | 0000039b | 000ab66a | 0000030b | 000ab672 | 0000039b | 000ab67a |
| 0700400 | 0000018b | 000ab682 | 0000017b | 000ab68a | 0000030b | 000ab692 | 0000017b | 000ab69a | 0000039b | 000ab6a2 | 00000393 | 000ab6aa |
| 0700460 | 0000032b | 000ab6b2 | 0000032b | 000ab6ba | 0000017b | 000ab6c2 | 00000383 | 000ab6ca | 00000393 | 000ab6d2 | 0000037b | 000ab6da |
| 0700540 | 00000363 | 000ab6e2 | 0000037b | 000ab6ea | 0000033b | 000ab6f2 | 0000016b | 000ab6fa | 000003a3 | 000ab702 | 00000393 | 000ab70a |
| 0700620 | 0000034b | 000ab712 | 0000030b | 000ab71a | 00000363 | 000ab722 | 0000039b | 000ab72a | 0000017b | 000ab732 | 00000323 | 000ab73a |
| 0700700 | 0000031b | 000ab742 | 000003a3 | 000ab74a | 0000033b | 000ab752 | 0000017b | 000ab75a | 00000323 | 000ab762 | 0000031b | 000ab76a |
| 0700760 | 000003a3 | 000ab772 | 0000033b | 000ab77a | 0000018b | 000ab782 | 0000017b | 000ab78a | 0000036b | 000ab792 | 0000030b | 000ab79a |
| 0701040 | 0000034b | 000ab7a2 | 00000373 | 00000007 | 00000173 | 000ab7b2 | 00000383 | 000ab7ba | 00000363 | 00000007 | 00000373 | 000ab93a |
| 0701120 | 0000017b | 00000007 | 00000343 | 000ab7ca | 0000037b | 000ab7d2 | 0000036b | 000ab7da | 0000032b | 000ab7e2 | 0000017b | 000ab7ea |
| 0701200 | 0000037b | 000ab7f2 | 0000039b | 000ab7fa | 0000030b | 000ab802 | 0000039b | 000ab80a | 0000018b | 000ab812 | 0000017b | 000ab81a |
| 0701260 | 0000030b | 000ab822 | 0000017b | 000ab82a | 0000039b | 000ab832 | 00000393 | 000ab83a | 0000032b | 000ab842 | 0000032b | 000ab84a |
| 0701340 | 0000017b | 000ab852 | 00000383 | 000ab85a | 00000393 | 000ab862 | 0000037b | 000ab86a | 00000363 | 000ab872 | 0000037b | 000ab87a |
| 0701420 | 0000033b | 000ab882 | 0000016b | 000ab88a | 000003a3 | 000ab892 | 00000193 | 000ab89a | 0000034b | 000ab8a2 | 0000030b | 000ab8aa |
| 0701500 | 00000363 | 000ab8b2 | 0000039b | 000ab8ba | 0000017b | 000ab8c2 | 00000323 | 000ab8ca | 0000031b | 000ab8d2 | 000003a3 | 000ab8da |
| 0701560 | 0000033b | 000ab8e2 | 0000017b | 000ab8ea | 00000323 | 000ab8f2 | 0000031b | 000ab8fa | 000003a3 | 000ab902 | 0000033b | 000ab90a |
| 0701640 | 0000018b | 000ab912 | 0000017b | 000ab91a | 0000036b | 000ab922 | 0000030b | 000ab92a | 0000034b | 000ab932 | 00000373 | 000ab93a |
| 0701720 | 0000017b | 000ab952 | 00000343 | 000ab95a | 0000037b | 000ab962 | 0000036b | 000ab96a | 0000032b | 000ab972 | 0000017b | 000ab97a |
| 0702000 | 0000037b | 000ab982 | 0000039b | 000ab98a | 0000030b | 000ab992 | 0000039b | 000ab99a | 0000018b | 000ab9a2 | 0000017b | 000ab9aa |
| 0702060 | 0000030b | 000ab9b2 | 0000017b | 000ab9ba | 0000039b | 000ab9c2 | 00000393 | 000ab9ca | 0000032b | 000ab9d2 | 0000032b | 000ab9da |
| 0702140 | 0000017b | 000ab9e2 | 00000383 | 000ab9ea | 00000393 | 000ab9f2 | 0000037b | 000ab9fa | 00000363 | 000aba02 | 0000037b | 000aba0a |
| 0702220 | 0000033b | 000aba12 | 0000016b | 000aba1a | 000003a3 | 000aba22 | 00000393 | 000aba2a | 0000034b | 000aba32 | 0000030b | 000aba3a |
| 0702300 | 00000363 | 000aba42 | 0000039b | 000aba4a | 0000017b | 000aba52 | 00000323 | 000aba5a | 0000031b | 000aba62 | 000003a3 | 000aba6a |
| 0702360 | 0000033b | 000aba72 | 0000017b | 000aba7a | 00000323 | 000aba82 | 0000031b | 000aba8a | 000003a3 | 000aba92 | 0000033b | 000aba9a |
| 0702440 | 0000018b | 000abaa2 | 0000017b | 000abaaa | 0000036b | 000abab2 | 0000030b | 000ababa | 0000034b | 000abac2 | 00000373 | 000ab7aa |
| 0702520 | 00001ebb | 000abad2 | 00000193 | 00000007 | 0014ab63 | 000abae2 | 00029403 | 00000007 | 0000017b | 000abaf2 | 00000343 | 000abafa |
| 0702600 | 0000037b | 000abb02 | 0000036b | 000abb0a | 0000032b | 000abb12 | 0000017b | 000abb1a | 0000037b | 000abb22 | 0000039b | 000abb2a |
| 0702660 | 0000030b | 000abb32 | 0000039b | 000abb3a | 0000018b | 000abb42 | 0000017b | 000abb4a | 0000030b | 000abb52 | 0000017b | 000abb5a |
| 0702740 | 0000039b | 000abb62 | 00000393 | 000abb6a | 0000032b | 000abb72 | 0000032b | 000abb7a | 0000017b | 000abb82 | 00000383 | 000abb8a |
| 0703020 | 00000393 | 000abb92 | 0000037b | 000abb9a | 00000363 | 000abba2 | 0000037b | 000abbaa | 0000033b | 000abbb2 | 0000016b | 000abbba |
| 0703100 | 000003a3 | 000abbc2 | 00000393 | 000abbca | 0000034b | 000abbd2 | 0000030b | 000abbda | 00000363 | 000abbe2 | 0000039b | 000abbea |
| 0703160 | 0000017b | 000abbf2 | 00000323 | 000abbfa | 0000031b | 000abc02 | 000003a3 | 000abc0a | 0000033b | 000abc12 | 0000017b | 000abc1a |
| 0703240 | 00000323 | 000abc22 | 0000031b | 000abc2a | 000003a3 | 000abc32 | 0000033b | 000abc3a | 0000018b | 000abc42 | 0000017b | 000abc4a |
| 0703320 | 0000036b | 000abc52 | 0000030b | 000abc5a | 0000034b | 000abc62 | 00000373 | 000abc6a | 00000173 | 000abc72 | 00000383 | 000abc7a |
| 0703400 | 00000363 | 00000007 | 0000017b | 000abc4a | 000abc8e | 0000017b | 000abc96 | 00000343 | 000abc9e | 0000037b | 000abca6 | 0000036b |
| 0703460 | 000abcae | 0000032b | 000abcb6 | 0000017b | 000abcbe | 0000037b | 000abcc6 | 0000039b | 000abcce | 0000030b | 000abcd6 | 0000039b |
| 0703540 | 000abcde | 0000018b | 000abce6 | 0000017b | 000abcee | 0000030b | 000abcf6 | 0000017b | 000abcfe | 0000039b | 000abd06 | 00000393 |
| 0703620 | 000abd0e | 0000032b | 000abd16 | 0000032b | 000abd1e | 0000017b | 000abd26 | 00000383 | 000abd2e | 00000393 | 000abd36 | 0000037b |
| 0703700 | 000abd3e | 00000363 | 000abd46 | 0000037b | 000abd4e | 0000033b | 000abd56 | 0000016b | 000abd5e | 000003a3 | 000abd66 | 00000393 |
| 0703760 | 000abd6e | 0000034b | 000abd76 | 0000030b | 000abd7e | 00000363 | 000abd86 | 0000039b | 000abd8e | 0000017b | 000abd96 | 00000323 |
| 0704040 | 000abd9e | 0000031b | 000abda6 | 000003a3 | 000abdae | 0000033b | 000abdb6 | 0000017b | 000abdbe | 00000323 | 000abdc6 | 0000031b |
| 0704120 | 000abdce | 000003a3 | 000abdd6 | 0000033b | 000abdde | 0000018b | 00000007 | 0200095f | 00000023 | 00000023 | 02000cdf | 0000001f |
| 0704200 | 00002377 | 01002d67 | 0000000b | 0100147f | 000abe2d | 02000ce7 | 000abe05 | 00002aff | 02000ce7 | 000abe25 | 00002aff | 0100147f |
| 0704260 | 000abe2d | 01002d67 | 0000000b | 0000000b | 00000007 | 0100147f | 00000007 | 02000ce7 | 000abe3d | 00002aff | 02000ce7 | 000abe5d |
| 0704340 | 00002aff | 0100147f | 00000007 | 00003157 | 00000007 | 00001d4f | 000abe66 | 00000103 | 000abe6e | 0000000b | 000abe76 | 03002017 |
| 0704420 | 00002c07 | 00002e87 | 000abe7e | 0000000b | 00000003 | 0200095f | 00000003 | 0000000b | 0200293f | 00003157 | 000001e3 | 02000a57 |
| 0704500 | 00000057 | 00000007 | 02000ce7 | 000abea9 | 00002aff | 004e5443 | 01002977 | 004e5443 | 0000017b | 000abee2 | 00000343 | 000abeea |
| 0704560 | 0000037b | 000abef2 | 0000036b | 000abefa | 0000032b | 000abf02 | 0000017b | 000abf0a | 0000037b | 000abf12 | 0000039b | 000abf1a |
| 0704640 | 0000030b | 000abf22 | 0000039b | 000abf2a | 0000018b | 000abf32 | 0000017b | 000abf3a | 0000030b | 000abf42 | 0000017b | 000abf4a |
| 0704720 | 0000039b | 000abf52 | 00000393 | 000abf5a | 0000032b | 000abf62 | 0000032b | 000abf6a | 0000017b | 000abf72 | 00000383 | 000abf7a |
| 0705000 | 00000393 | 000abf82 | 0000037b | 000abf8a | 00000363 | 000abf92 | 0000037b | 000abf9a | 0000033b | 000abfa2 | 0000016b | 000abfaa |
| 0705060 | 000003a3 | 000abfb2 | 00000393 | 000abfba | 0000034b | 000abfc2 | 0000030b | 000abfca | 00000363 | 000abfd2 | 0000039b | 000abfda |
| 0705140 | 0000017b | 000abfe2 | 00000323 | 000abfea | 0000031b | 000abff2 | 000003a3 | 000abffa | 0000033b | 000ac002 | 0000017b | 000ac00a |

| | | | | | | | | | | | | |
|---|---|---|---|---|---|---|---|---|---|---|---|---|
| 0705220 | 00000323 | 000ac012 | 0000031b | 000ac01a | 000003a3 | 000ac022 | 0000033b | 000ac02a | 0000018b | 000ac032 | 0000017b | 000ac03a |
| 0705300 | 0000036b | 000ac042 | 0000030b | 000ac04a | 0000034b | 000ac052 | 00000373 | 000ac05a | 00000173 | 000ac062 | 00000383 | 000ac06a |
| 0705360 | 00000363 | 00000007 | 0000017b | 000ac03a | 0000017b | 000ac082 | 00000343 | 000ac08a | 0000037b | 000ac092 | 0000036b | 000ac09a |
| 0705440 | 0000032b | 000ac0a2 | 0000017b | 000ac0aa | 0000037b | 000ac0b2 | 0000039b | 000ac0ba | 0000030b | 000ac0c2 | 0000039b | 000ac0ca |
| 0705520 | 0000018b | 000ac0d2 | 0000017b | 000ac0da | 0000030b | 000ac0e2 | 0000017b | 000ac0ea | 0000039b | 000ac0f2 | 00000393 | 000ac0fa |
| 0705600 | 0000032b | 000ac102 | 0000032b | 000ac10a | 0000017b | 000ac112 | 00000383 | 000ac11a | 00000393 | 000ac122 | 0000037b | 000ac12a |
| 0705660 | 00000363 | 000ac132 | 0000037b | 000ac13a | 0000033b | 000ac142 | 0000016b | 000ac14a | 000003a3 | 000ac152 | 00000393 | 000ac15a |
| 0705740 | 0000034b | 000ac162 | 0000030b | 000ac16a | 00000363 | 000ac172 | 0000039b | 000ac17a | 0000017b | 000ac182 | 00000323 | 000ac18a |
| 0706020 | 0000031b | 000ac192 | 000003a3 | 000ac19a | 0000033b | 000ac1a2 | 0000017b | 000ac1aa | 00000323 | 000ac1b2 | 0000031b | 000ac1ba |
| 0706100 | 000003a3 | 000ac1c2 | 0000033b | 000ac1ca | 0000018b | 00000007 | 0500236f | 00001d57 | 00002367 | 000001e3 | 000abde5 | 0000315f |
| 0706160 | 02000a57 | 00000057 | 00000007 | 02000ce7 | 000ac1d1 | 00002aff | 004e5983 | 01002977 | 004e5983 | 00000007 | 10002c4f | 000ac214 |
| 0706240 | 000ac218 | 000ac21c | 000ac220 | 000ac224 | 000ac228 | 000ac22c | 000ac230 | 000ac234 | 000ac238 | 000ac23c | 000ac240 | 000ac244 |
| 0706320 | 000ac248 | 000ac24c | 000ac250 | 01001b97 | 00000ce7 | 000ac255 | 000ac26e | 01001b97 | 00001d57 | 000ac265 | 000ac276 | 0000098f |
| 0706400 | 000ac286 | 01001b97 | 000022ff | 000ac27d | 000ac28e | 0000098f | 000ac29e | 01001b97 | 00001c67 | 000ac295 | 000ac2a6 | 000009ff |
| 0706460 | 000ac2ae | 000009ff | 00000007 | 03002c3f | 00000ce7 | 00002583 | 0000203f | 02000ce7 | 000ac2b5 | 00002aff | 02000ce7 | 000ac2dd |
| 0706540 | 00002aff | 03002c3f | 00000ce7 | 00002583 | 0000203f | 000009ff | 000ac2ae | 00001c67 | 00000007 | 000022ff | 000ac2f6 | 010022ff |
| 0706620 | 00001c67 | 000009ff | 00000007 | 000ac305 | 00000007 | 00001d57 | 000ac316 | 01001d57 | 000ac305 | 01000ce7 | 000ac325 | 02001f6f |
| 0706700 | 00003157 | 000ac33c | 02002387 | 00003157 | 000ac348 | 02002387 | 00003157 | 00002c07 | 02000a57 | 00000057 | 00000007 | 02000ce7 |
| 0706760 | 000ac34d | 00002aff | 004e5e03 | 01001eaf | 004e5e03 | 00000007 | 10002c4f | 000ac384 | 000ac388 | 000ac38c | 000ac390 | 000ac394 |
| 0707040 | 000ac398 | 000ac39c | 000ac3a0 | 000ac3a4 | 000ac3a8 | 000ac3ac | 000ac3b0 | 000ac3b4 | 000ac3b9 | 000ac3bc | 000ac3c0 | 01001b97 |
| 0707120 | 00000ce7 | 000ac3c5 | 000ac3de | 01001b97 | 00001d57 | 000ac3d5 | 000ac3e6 | 0000098f | 000ac3f6 | 01001b97 | 00003297 | 000ac3ed |
| 0707200 | 000ac3fe | 000009ff | 00000007 | 03002c3f | 00000ce7 | 00002583 | 0000203f | 02000ce7 | 000ac405 | 00002aff | 02000ce7 | 000ac42d |
| 0707260 | 00002aff | 03002c3f | 00000ce7 | 00002583 | 0000203f | 000009ff | 00000007 | 00003297 | 00000007 | 00001d57 | 000ac446 | 01001d57 |
| 0707340 | 00003297 | 01000ce7 | 000ac455 | 07002987 | 0000000b | 00000003 | 00000003 | 00000003 | 00000003 | 00000003 | 0000000b | 04002107 |
| 0707420 | 00001d57 | 0000000b | 0000001f | 00001c3f | 02000ce7 | 000ac485 | 00002aff | 02000ce7 | 000ac4b1 | 00002aff | 04002107 | 00001d57 |
| 0707500 | 0000000b | 0000001f | 00001c3f | 01001d57 | 00000cdf | 020024af | 000ac4c5 | 0000001f | 02000ce7 | 000ac4cd | 00002aff | 02000ce7 |
| 0707560 | 000ac4f1 | 00002aff | 020024af | 000ac4fd | 0000001f | 01001d57 | 00000cdf | 01001d57 | 000ac50d | 02000cdf | 00002c07 | 00003297 |
| 0707640 | 01001d57 | 000ac50d | 000ac529 | 00000007 | 01001f67 | 00003297 | 000032a7 | 000ac534 | 000ac591 | 000001e3 | 00002367 | 00001d57 |
| 0707720 | 0500236f | 000ac544 | 000ac540 | 000ac53c | 000ac538 | 0000315f | 02000ce7 | 000ac549 | 00002aff | 02000ce7 | 000ac579 | 00002aff |
| 0710000 | 0500236f | 00001d57 | 00002367 | 000001e3 | 000ac591 | 0000315f | 0200095f | 00000023 | 00000023 | 00003297 | 00000007 | 000003a3 |
| 0710060 | 000ac5ae | 00000313 | 000ac5b6 | 0000037b | 000ac5be | 00000323 | 000ac5c6 | 000003cb | 00000007 | 0000017b | 000ac5a6 | 0000017b |
| 0710140 | 000ac5de | 000003a3 | 000ac5e6 | 00000313 | 000ac5ee | 0000037b | 000ac5f6 | 00000323 | 000ac5fe | 000003cb | 00000007 | 0000017b |
| 0710220 | 000ac60e | 00000343 | 000ac616 | 0000037b | 000ac61e | 0000036b | 000ac626 | 0000032b | 000ac62e | 0000017b | 000ac636 | 0000037b |
| 0710300 | 000ac63e | 0000039b | 000ac646 | 0000030b | 000ac64e | 0000039b | 000ac656 | 0000018b | 000ac65e | 0000017b | 000ac666 | 0000030b |
| 0710360 | 000ac66e | 0000017b | 000ac676 | 0000039b | 000ac67e | 00000393 | 000ac686 | 0000032b | 000ac68e | 0000032b | 000ac696 | 0000017b |
| 0710440 | 000ac69e | 00000393 | 000ac6a6 | 00000393 | 000ac6ae | 0000037b | 000ac6b6 | 00000363 | 000ac6be | 0000037b | 000ac6c6 | 0000033b |
| 0710520 | 000ac6ce | 0000016b | 000ac6d6 | 000003a3 | 000ac6de | 00000393 | 000ac6e6 | 0000034b | 000ac6ee | 0000030b | 000ac6f6 | 00000363 |
| 0710600 | 000ac6fe | 0000039b | 000ac706 | 0000017b | 000ac70e | 00000323 | 000ac716 | 0000031b | 000ac71e | 000003a3 | 000ac726 | 0000033b |
| 0710660 | 000ac72e | 0000017b | 000ac736 | 00000323 | 000ac73e | 0000031b | 000ac746 | 000003a3 | 000ac74e | 0000033b | 000ac756 | 0000018b |
| 0710740 | 00000007 | 0000017b | 000ac766 | 00000343 | 000ac76e | 0000037b | 000ac776 | 0000036b | 000ac77e | 0000032b | 000ac786 | 0000017b |
| 0711020 | 000ac78e | 0000037b | 000ac796 | 0000039b | 000ac79e | 0000030b | 000ac7a6 | 0000039b | 000ac7ae | 0000018b | 000ac7b6 | 0000017b |
| 0711100 | 000ac7be | 0000030b | 000ac7c6 | 0000017b | 000ac7ce | 0000039b | 000ac7d6 | 00000393 | 000ac7de | 0000032b | 000ac7e6 | 0000032b |
| 0711160 | 000ac7ee | 0000017b | 000ac7f6 | 00000383 | 000ac7fe | 00000393 | 000ac806 | 0000037b | 000ac80e | 00000363 | 000ac816 | 0000037b |
| 0711240 | 000ac81e | 0000033b | 000ac826 | 0000016b | 000ac82e | 000003a3 | 000ac836 | 00000393 | 000ac83e | 0000034b | 000ac846 | 0000030b |
| 0711320 | 000ac84e | 00000363 | 000ac856 | 0000039b | 000ac85e | 0000017b | 000ac866 | 00000323 | 000ac86e | 0000031b | 000ac876 | 000003a3 |
| 0711400 | 000ac87e | 0000033b | 000ac886 | 0000017b | 000ac88e | 00000323 | 000ac896 | 0000031b | 000ac89e | 000003a3 | 000ac8a6 | 0000033b |
| 0711460 | 000ac8ae | 0000018b | 000ac5d6 | 0000017b | 000ac8be | 00000343 | 000ac8c6 | 0000037b | 000ac8ce | 0000036b | 000ac8d6 | 0000032b |
| 0711540 | 000ac8de | 0000017b | 000ac8e6 | 0000037b | 000ac8ee | 0000039b | 000ac8f6 | 0000030b | 000ac8fe | 0000019b | 000ac906 | 0000018b |
| 0711620 | 000ac90e | 0000017b | 000ac916 | 0000030b | 000ac91e | 0000017b | 000ac926 | 0000039b | 000ac92e | 00000393 | 000ac936 | 0000032b |
| 0711700 | 000ac93e | 0000032b | 000ac946 | 0000017b | 000ac94e | 00000383 | 000ac956 | 00000393 | 000ac95e | 0000037b | 000ac966 | 00000363 |
| 0711760 | 000ac96e | 0000037b | 000ac976 | 0000033b | 000ac97e | 0000016b | 000ac986 | 000003a3 | 000ac98e | 00000393 | 000ac996 | 0000034b |
| 0712040 | 000ac99e | 0000030b | 000ac9a6 | 00000363 | 000ac9ae | 0000039b | 000ac9b6 | 0000017b | 000ac9be | 00000323 | 000ac9c6 | 0000031b |
| 0712120 | 000ac9ce | 000003a3 | 000ac916 | 0000033b | 000ac9de | 0000017b | 000ac9e6 | 00000323 | 000ac9ee | 0000031b | 000ac9f6 | 000003a3 |
| 0712200 | 000ac9fe | 0000033b | 000aca06 | 0000018b | 000aca0e | 0000017b | 000aca16 | 000003a3 | 000aca1e | 00000313 | 000aca26 | 0000037b |
| 0712260 | 000aca2e | 00000323 | 000aca36 | 000003cb | 00000007 | 00000173 | 000aca46 | 00000383 | 000aca4e | 00000363 | 00000007 | 000003cb |

| | | | | | | | | | | | | |
|---|---|---|---|---|---|---|---|---|---|---|---|---|
| 0712340 | 000acbd6 | 0000017b | 00000007 | 00000343 | 000aca5e | 0000037b | 000aca66 | 0000036b | 000aca6e | 0000032b | 000aca76 | 0000017b |
| 0712420 | 000aca7e | 0000037b | 000aca86 | 0000039b | 000aca8e | 0000030b | 000aca96 | 0000039b | 000aca9e | 0000018b | 000acaa6 | 0000017b |
| 0712500 | 27f00028 | 000acaec | 2ca0b66c | 00000000 | 00000001 | 000a8b44 | 000acaec | 0002438a | 000aa97c | 02000a3f | 29c8cad6 | 000aaa68 |
| 0712560 | 000a8b54 | 2954000c | 0002438a | 48f82edc | 000032d7 | b3280393 | 000aab80 | 00000000 | 0009ed20 | 00000000 | 000acc04 | 00000058 |
| 0712640 | b288b66c | 00000096 | 7fffffff | 000aeb70 | 02000ce5 | 0100147d | 01002d65 | 0000000b | 00002aff | 000acc08 | 0000002c | b288b66c |
| 0712720 | 00000096 | 7fffffff | 000acb18 | 02000ce5 | 0100147d | 01002d65 | 0000000b | 00002aff | 00312f68 | 6f6d652f | 6f736173 | 312f612f |
| 0713000 | 73726565 | 2f70726f | 6c6f672d | 74726961 | 6c732f64 | 6374672f | 64637467 | 312f7365 | 6d6f7000 | 00342f68 | 6f6d652f | 6f736173 |
| 0713060 | 312f612f | 73726565 | 2f70726f | 6c6f672d | 74726961 | 6c732f64 | 6374672f | 64637467 | 312f7365 | 6d6f702e | 706c00c6 | 0000002c |
| 0713140 | 0009ccf8 | b27cb66c | 00000098 | 7fffffff | 000aab7c | 02000ce5 | 0200293d | 000032f7 | 00000223 | 00002aff | 000acc70 | 0000002c |
| 0713220 | b288b66c | 00000097 | 7fffffff | 000acbdc | 02000ce5 | 0100147d | 01002d65 | 0000000b | 00002aff | 0000002c | 0009ece8 | b27cb66c |
| 0713300 | 0000009e | 7fffffff | 000aac14 | 02000ce5 | 02001f6d | 000032f7 | 00002c07 | 00002aff | 28c40012 | 000aaa74 | 4e1c0000 | 00001aef |
| 0713360 | 228c0000 | 000acd30 | 00000090 | b27cb66c | 0000009a | 0000009d | 0009cbc1 | 02000ce5 | 02002385 | 000032f7 | 00002c07 | 00002aff |
| 0713440 | 000accd4 | 00000038 | b130b66c | 0000009b | 0000009f | 000accd9 | 02000ce5 | 05001b0d | 00000887 | 00000013 | 00002c07 | 00585ce3 |
| 0713520 | 00000223 | 00002aff | 000acd30 | 0000002c | b4f0b4e4 | 0000009a | 7fffffff | 0007eaad | 00000000 | 00000000 | 000acca0 | 0002438a |
| 0713600 | 000a46e4 | 28c40030 | 000aac38 | 56f8671c | 5fa05aec | 020031f7 | 608848f8 | 447c0000 | 02000cdf | 4b8c0000 | 00002c07 | 6bf422bc |
| 0713660 | 0007ed2c | 000aec34 | 00001dec | 0000018b | 000acd3e | 0000017b | 000acd46 | 000003a3 | 000acd4e | 00000313 | 000acd56 | 0000037b |
| 0713740 | 000acd5e | 00000323 | 000acd66 | 000003cb | 000aca3e | 00008b13 | 000acd76 | 00000193 | 00000007 | 001694e3 | 000acd86 | 00048ec3 |
| 0714020 | 00000007 | 0000017b | 000acd96 | 00000343 | 000acd9e | 0000037b | 000acda6 | 0000036b | 000acdae | 0000032b | 000acdb6 | 0000017b |
| 0714100 | 000acdbe | 0000037b | 000acdc5 | 0000039b | 000acdce | 0000030b | 000acdd6 | 0000039b | 000acdde | 0000018b | 000acde6 | 0000017b |
| 0714160 | 000acdee | 0000030b | 000acdf6 | 0000017b | 000acdfe | 0000039b | 000ace06 | 00000393 | 000ace0e | 0000032b | 000ace16 | 0000032b |
| 0714240 | 000ace1e | 0000017b | 000ace26 | 00000383 | 000ace2e | 00000393 | 000ace36 | 0000037b | 000ace3e | 00000363 | 000ace46 | 0000037b |
| 0714320 | 000ace4e | 0000033b | 000ace56 | 0000016b | 000ace5e | 000003a3 | 000ace66 | 00000393 | 000ace6e | 0000034b | 000ace76 | 0000030b |
| 0714400 | 000ace7e | 00000363 | 000ace86 | 0000039b | 000ace8e | 0000017b | 000ace96 | 00000323 | 000ace9e | 0000031b | 000acea6 | 000003a3 |
| 0714460 | 000aceae | 0000033b | 000aceb6 | 0000017b | 000acebe | 00000323 | 000acec6 | 0000031b | 000acece | 000003a3 | 000aced6 | 0000033b |
| 0714540 | 000acede | 0000018b | 000acee6 | 0000017b | 000aceee | 000003a3 | 000acef6 | 00000343 | 000acefe | 0000032b | 000acf06 | 0000030b |
| 0714620 | 000acf0e | 00000323 | 000acf16 | 00000173 | 000acf1e | 00000383 | 000acf26 | 00000363 | 00000007 | 0000017b | 000aceee | 000acf3a |
| 0714700 | 0000017b | 000acf42 | 00000343 | 000acf4a | 0000037b | 000acf52 | 0000036b | 000acf5a | 0000032b | 000acf62 | 0000017b | 000acf6a |
| 0714760 | 0000037b | 000acf72 | 0000039b | 000acf7a | 0000030b | 000acf82 | 0000039b | 000acf8a | 0000018b | 000acf92 | 0000017b | 000acf9a |
| 0715040 | 0000030b | 000acfa2 | 0000017b | 000acfaa | 0000039b | 000acfb2 | 00000393 | 000acfba | 0000032b | 000acfc2 | 0000032b | 000acfca |
| 0715120 | 0000017b | 000acfd2 | 00000383 | 000acfda | 00000393 | 000acfe2 | 0000037b | 000acfea | 00000363 | 000acff2 | 0000037b | 000acffa |
| 0715200 | 0000033b | 000ad002 | 0000016b | 000ad00a | 000003a3 | 000ad012 | 00000393 | 000ad01a | 0000034b | 000ad022 | 0000030b | 000ad02a |
| 0715260 | 00000363 | 000ad032 | 0000039b | 000ad03a | 0000017b | 000ad042 | 00000323 | 000ad04a | 0000031b | 000ad052 | 000003a3 | 000ad05a |
| 0715340 | 0000033b | 000ad062 | 0000017b | 000ad06a | 00000323 | 000ad072 | 0000031b | 000ad07a | 000003a3 | 000ad082 | 0000033b | 000ad08a |
| 0715420 | 0000018b | 00000007 | 0200095f | 00000063 | 0000002b | 02000cdf | 0000001f | 00002377 | 01002d67 | 0000000b | 0100147f | 000ad0d9 |
| 0715500 | 02000ce7 | 000ad0b1 | 00002aff | 02000ce7 | 000ad0d1 | 00002aff | 0100147f | 000ad0d9 | 01002d67 | 0000000b | 0000000b | 00000007 |
| 0715560 | 0100147f | 000ad111 | 02000ce7 | 000ad0e9 | 00002aff | 02000ce7 | 000ad109 | 00002aff | 0100147f | 000ad111 | 01002d67 | 0000000b |
| 0715640 | 0000000b | 000ad0e2 | 0100147f | 00000007 | 02000ce7 | 000ad121 | 00002aff | 02000ce7 | 000ad141 | 00002aff | 0100147f | 00000007 |
| 0715720 | 0000327f | 00000007 | 00001d4f | 000ad14a | 00000103 | 000ad152 | 00000013 | 000ad15a | 03002017 | 00002c07 | 00002e87 | 000ad162 |
| 0716000 | 0000000b | 00000003 | 0200095f | 00000003 | 0000000b | 0200293f | 0000327f | 00000203 | 02000a57 | 00000057 | 00000007 | 02000ce7 |
| 0716060 | 000ad18d | 00002aff | 004e5443 | 01002977 | 004e5443 | 0000017b | 000ad1c6 | 00000343 | 000ad1ce | 0000037b | 000ad1d6 | 0000036b |
| 0716140 | 000ad1de | 0000032b | 000ad1e6 | 0000017b | 000ad1ee | 0000037b | 000ad1f6 | 0000039b | 000ad1fe | 0000030b | 000ad206 | 0000039b |
| 0716220 | 000ad20e | 0000018b | 000ad216 | 0000017b | 000ad21e | 0000030b | 000ad226 | 0000017b | 000ad22e | 0000039b | 000ad236 | 00000393 |
| 0716300 | 000ad23e | 0000032b | 000ad246 | 0000032b | 000ad24e | 0000017b | 000ad256 | 00000383 | 000ad25e | 00000393 | 000ad265 | 0000037b |
| 0716360 | 000ad26e | 00000363 | 000ad276 | 0000037b | 000ad27e | 0000033b | 000ad286 | 0000016b | 000ad28e | 000003a3 | 000ad296 | 00000393 |
| 0716440 | 000ad29e | 0000034b | 000ad2a6 | 0000030b | 000ad2ae | 00000363 | 000ad2b6 | 0000039b | 000ad2be | 0000017b | 000ad2c6 | 00000323 |
| 0716520 | 000ad2ce | 0000031b | 000ad2d6 | 000003a3 | 000ad2de | 0000033b | 000ad2e6 | 0000017b | 000ad2ee | 00000323 | 000ad2f6 | 0000031b |
| 0716600 | 000ad2fe | 000003a3 | 000ad305 | 0000033b | 000ad30e | 0000018b | 000ad316 | 0000017b | 000ad31e | 000003a3 | 000ad326 | 00000343 |
| 0716660 | 000ad32e | 0000032b | 000ad336 | 0000030b | 000ad33e | 00000323 | 000ad346 | 00000173 | 000ad34e | 00000383 | 000ad356 | 00000363 |
| 0716740 | 00000007 | 0000017b | 000ad31e | 0000017b | 000ad36e | 00000343 | 000ad376 | 0000037b | 000ad37e | 0000036b | 000ad386 | 0000032b |
| 0717020 | 000ad38e | 0000017b | 000ad396 | 0000037b | 000ad39e | 0000039b | 000ad3a6 | 0000030b | 000ad3ae | 0000039b | 000ad3b6 | 0000018b |
| 0717100 | 000ad3be | 0000017b | 000ad3c6 | 0000030b | 000ad3ce | 0000017b | 000ad3d6 | 0000039b | 000ad3de | 00000393 | 000ad3e6 | 0000032b |
| 0717160 | 000ad3ee | 0000032b | 000ad3f6 | 0000017b | 000ad3fe | 00000383 | 000ad406 | 00000393 | 000ad40e | 0000037b | 000ad416 | 00000363 |
| 0717240 | 000ad41e | 0000037b | 000ad426 | 0000033b | 000ad42e | 0000016b | 000ad436 | 000003a3 | 000ad43e | 00000393 | 000ad446 | 0000034b |
| 0717320 | 000ad44e | 0000030b | 000ad456 | 00000363 | 000ad45e | 0000039b | 000ad466 | 0000017b | 000ad46e | 00000323 | 000ad476 | 0000031b |
| 0717400 | 000ad47e | 000003a3 | 000ad486 | 0000033b | 000ad48e | 0000017b | 000ad496 | 00000323 | 000ad49e | 0000031b | 000ad4a6 | 000003a3 |

| | | | | | | | | | | | | |
|---|---|---|---|---|---|---|---|---|---|---|---|---|
| 0717460 | 000ad4ae | 0000033b | 000ad4b6 | 0000018b | 00000007 | 0500236f | 00001d57 | 00002367 | 00000203 | 000ad091 | 0000315f | 02000a57 |
| 0717540 | 00000057 | 00000007 | 02000ce7 | 000ad4bd | 00002aff | 004e5983 | 01002977 | 004e5983 | 000adcd2 | 10002c4f | 000ad65a | 000ad586 |
| 0717620 | 000ad508 | 000ad5ca | 000ad510 | 000ad61e | 000ad518 | 000ad51c | 000ad520 | 000ad524 | 000ad528 | 000ad52c | 000ad530 | 000ad6d2 |
| 0717700 | 000ad538 | 000ad53c | 01001b97 | 00003217 | 000ad541 | 000ad552 | 0000098f | 000ad55a | 0000098f | 000ad57e | 02002c57 | 000ad564 |
| 0717760 | 000ad56e | 02432b0b | 000ad576 | 00032183 | 00000007 | 000ad561 | 000ad59e | 000ad58d | 000ad716 | 03002c57 | 000ad56e | 000ad564 |
| 0720040 | 0000000b | 00000a3f | 000ad5c2 | 02002c57 | 000ad5a8 | 000ad5b2 | 02634b9b | 000ad5ba | 000003a3 | 00000007 | 000ad5a5 | 000ad5e2 |
| 0720120 | 000ad5d1 | 000ad696 | 03002c57 | 000ad5b2 | 000ad5a8 | 0000000b | 000009ff | 000ad5ea | 00000a3f | 000ad616 | 02002c57 | 000ad5f4 |
| 0720200 | 000ad5fe | 02639bab | 000ad606 | 0313a393 | 000ad60e | 00032b2b | 00000007 | 000ad5f1 | 000ad636 | 000ad625 | 000ad620 | 03002c57 |
| 0720260 | 000ad5fe | 000ad5f4 | 0000000b | 00000a3f | 000ad652 | 02002c57 | 000ad640 | 000ad64a | 00029983 | 00000007 | 000ad63d | 000ad672 |
| 0720340 | 000ad661 | 000ad65c | 03002c57 | 000ad64a | 000ad640 | 0000000b | 00000a3f | 000ad68e | 02002c57 | 000ad67c | 000ad686 | 0000029b |
| 0720420 | 00000007 | 000ad679 | 000ad6ae | 000ad69d | 000ad7d2 | 03002c57 | 000ad686 | 000ad67c | 0000000b | 00000a3f | 000ad6ca | 02002c57 |
| 0720500 | 000ad6b8 | 000ad6c2 | 029b2b6b | 00000007 | 000ad6b5 | 000ad6ea | 000ad6d9 | 000ad862 | 03002c57 | 000ad6c2 | 000ad6b8 | 0000000b |
| 0720560 | 00000a3f | 000ad70e | 02002c57 | 000ad6f4 | 000ad6fe | 02432b0b | 000ad706 | 00000323 | 00000007 | 000ad6f1 | 000ad72e | 000ad71d |
| 0720640 | 000ad718 | 03002c57 | 000ad6fe | 000ad6f4 | 0000000b | 000009ff | 000ad73e | 01001b97 | 00000ce7 | 000ad735 | 000ad74e | 01001b97 |
| 0720720 | 00003257 | 000ad745 | 000ad756 | 0000098f | 000ad77a | 02002c57 | 000ad5a8 | 000ad76a | 02634b9b | 000ad772 | 000003a3 | 00000007 |
| 0721000 | 000ad75d | 000ad782 | 00000a3f | 000ad79e | 02002c57 | 000ad67c | 000ad796 | 0000029b | 00000007 | 000ad789 | 000ad7a6 | 00000a3f |
| 0721060 | 000ad7ca | 02002c57 | 000ad7b0 | 000ad7ba | 02634b9b | 000ad7c2 | 0003a193 | 00000007 | 000ad7ad | 000ad7ea | 000ad7d9 | 000ad7d4 |
| 0721140 | 03002c57 | 000ad7ba | 000ad7b0 | 0000000b | 000009ff | 000ad7f2 | 00000a3f | 000ad802 | 01001b97 | 00002327 | 000ad7f9 | 000ad80a |
| 0721220 | 0000098f | 000ad826 | 02002c57 | 000ad6b8 | 000ad81e | 029b2b6b | 00000007 | 000ad811 | 000ad82e | 00000a3f | 000ad85a | 02002c57 |
| 0721300 | 000ad838 | 000ad842 | 029b2b6b | 000ad84a | 030b73a3 | 000ad852 | 034b1b9b | 00000007 | 000ad835 | 000ad87a | 000ad869 | 000ad864 |
| 0721360 | 03002c57 | 000ad842 | 000ad838 | 0000000b | 000009ff | 000ad882 | 00000a3f | 000ad892 | 01001b97 | 00001c67 | 000ad889 | 000ad8a2 |
| 0721440 | 01001b97 | 00000cdf | 000ad899 | 000ad8b2 | 01001b97 | 00003187 | 000ad8a9 | 000ad8ba | 0000098f | 000ad8de | 02002c57 | 000ad564 |
| 0721520 | 000ad8ce | 02432b0b | 000ad8d6 | 00032183 | 00000007 | 000ad8c1 | 000ad8e6 | 00000a3f | 000ad8ee | 0000153f | 000ad8fe | 01001b97 |
| 0721600 | 00003287 | 000ad8f5 | 000ad906 | 0000098f | 000ad92a | 02002c57 | 000ad564 | 000ad91a | 02432b0b | 000ad922 | 00032183 | 00000007 |
| 0721660 | 000ad90d | 000ad932 | 00000a3f | 000ad95e | 02002c57 | 000ad5f4 | 000ad946 | 02639bab | 000ad94e | 0313a393 | 000ad956 | 00032b2b |
| 0721740 | 00000007 | 000ad939 | 000ad966 | 00000a3f | 000ad992 | 02002c57 | 000ad838 | 000ad97a | 029b2b6b | 000ad982 | 030b73a3 | 000ad98a |
| 0722020 | 034b1b9b | 00000007 | 000ad96d | 000ad99a | 000009ff | 000ad9a2 | 00000a3f | 000ad9be | 02002c57 | 000ad640 | 000ad9b6 | 00029983 |
| 0722100 | 00000007 | 000ad9a9 | 000ad9c6 | 00000a3f | 000ad9ea | 02002c57 | 000ad7b0 | 000ad9da | 02634b9b | 000ad9e2 | 0003a193 | 00000007 |
| 0722160 | 000ad9cd | 000ad9f2 | 0000165f | 000ad9fa | 00000a3f | 000ada1e | 02002c57 | 000ad6f4 | 000ada0e | 02432b0b | 000ada16 | 00000323 |
| 0722240 | 00000007 | 000ada01 | 000ada26 | 000009ff | 00000007 | 000009ff | 000ad5ea | 02000a3f | 000ad564 | 000ad5a8 | 000009ff | 000ad5ea |
| 0722320 | 00000a3f | 000ad616 | 000ad5f4 | 000ada62 | 00000a3f | 000ad652 | 000ad640 | 000ada72 | 00000a3f | 000ad68e | 000ad67c | 000ada82 |
| 0722400 | 00000a3f | 000ad6ca | 000ad6b8 | 000ada92 | 00000a3f | 000ad70e | 000ad6f4 | 00000007 | 000009ff | 000ad73e | 000ada35 | 000ada52 |
| 0722460 | 00003217 | 000adaa2 | 06003217 | 000ada35 | 000ad5f4 | 000ad640 | 000ad67c | 000ad6b8 | 000ad6f4 | 03002c3f | 00000ce7 | 00002583 |
| 0722540 | 00002d2f | 02000ce7 | 000adacd | 00002aff | 02000ce7 | 000adaf5 | 00002aff | 03002c3f | 00000ce7 | 00002583 | 00002d2f | 040021c7 |
| 0722620 | 00000ce7 | 0000257b | 00002583 | 0000257b | 00000a3f | 000ad79e | 000ad67c | 000adb32 | 00000a3f | 000ad7ca | 000ad7b0 | 00000007 |
| 0722700 | 000009ff | 000ad7f2 | 000ad5a8 | 000adb22 | 00003257 | 000adb42 | 03003257 | 000ad5a8 | 000ad67c | 000ad7b0 | 00000a3f | 000ad85a |
| 0722760 | 000ad838 | 00000007 | 000009ff | 000ad882 | 000ad6b8 | 000adb6a | 00002327 | 000adb7a | 02002327 | 000ad6b8 | 000ad838 | 03002c3f |
| 0723040 | 00000cdf | 000012c3 | 00002d37 | 02000ce7 | 000adb95 | 00002aff | 02000ce7 | 000adbbd | 00002aff | 03002c3f | 00000cdf | 000012c3 |
| 0723120 | 00002d37 | 040021c7 | 00000cdf | 000012bb | 000012c3 | 000012c3 | 00000a3f | 000ad8ee | 000adc62 | 000adc72 | 00000a3f | 000ad95e |
| 0723200 | 000ad5f4 | 000adc0a | 00000a3f | 000ad992 | 000ad838 | 00000007 | 000009ff | 000ad9a2 | 000ad564 | 000adbfa | 00003287 | 000adc1a |
| 0723260 | 03003287 | 000ad564 | 000ad5f4 | 000ad838 | 00000a3f | 000ad9be | 000ad640 | 000adc52 | 00000a3f | 000ad9ea | 000ad7b0 | 00000007 |
| 0723340 | 0000165f | 000ad9fa | 000adc29 | 000adc42 | 00000a3f | 000ada1e | 000ad6f4 | 00000007 | 000009ff | 00000007 | 000ad564 | 000adbea |
| 0723420 | 00003187 | 000adc82 | 03003187 | 000ad564 | 000adc62 | 000ad6f4 | 02000cdf | 00001c67 | 000adc91 | 02000a3f | 000adb89 | 000adca1 |
| 0723500 | 02000a3f | 000adb51 | 000adcad | 02000ce7 | 000adab1 | 000adcb9 | 000adcd9 | 000adce6 | 02000d27 | 000ad64a | 000ad640 | 000adced |
| 0723560 | 000adcfa | 02000d27 | 000ad56e | 000ad564 | 000add01 | 000add0e | 02000d27 | 000ad6fe | 000ad6f4 | 000add15 | 000add22 | 02000d27 |
| 0723640 | 000ad5b2 | 000ad5a8 | 000add29 | 000add36 | 02000d27 | 000ad686 | 000ad67c | 000add3d | 000add4a | 02000d27 | 000ad7ba | 000ad7b0 |
| 0723720 | 000add51 | 000add5e | 02000d27 | 000ad5fe | 000ad5f4 | 000add65 | 000add72 | 02000d27 | 000ad6c2 | 000ad6b8 | 000add79 | 00000007 |
| 0724000 | 02000d27 | 000ad842 | 000ad838 | 02001f6f | 0000327f | 000add8c | 02002387 | 0000327f | 000add98 | 02002387 | 0000327f | 00002c07 |
| 0724060 | 02000a57 | 00000057 | 00000007 | 02000ce7 | 000add9d | 00002aff | 004e5e03 | 01001eaf | 004e5e03 | 00000007 | 10002c4f | 000addd4 |
| 0724140 | 000addd8 | 000adddc | 000adde0 | 000adde4 | 000adde8 | 000addec | 000addf0 | 000addf4 | 000addf8 | 000addfc | 000ade00 | 000ade04 |
| 0724220 | 000ade08 | 000ade0c | 000ade10 | 00001e9f | 00000007 | 0500236f | 00001d57 | 00002367 | 00000203 | 000ade65 | 0000315f | 02000ce7 |
| 0724300 | 000ade1d | 00002aff | 02000ce7 | 000ade4d | 00002aff | 0500236f | 00001d57 | 00002367 | 00000203 | 000ade65 | 0000315f | 0200095f |
| 0724360 | 00000063 | 0000002b | 00002d77 | 02002387 | 0000327f | 00002c07 | 02001f6f | 0000327f | 00002c07 | 02000a57 | 00000057 | 00000007 |
| 0724440 | 02000ce7 | 000ade81 | 00002aff | 00507763 | 01002977 | 00507763 | 0000327f | 05001b0f | 000adeb8 | 000adebc | 000adec0 | 000adec4 |
| 0724520 | 00000203 | 02001e17 | 000aded0 | 00000203 | 04002d1f | 000adedc | 000adee0 | 000adee4 | 00000203 | 0200229f | 000adef0 | 00000203 |

| | | | | | | | | | | | | |
|---|---|---|---|---|---|---|---|---|---|---|---|---|
| 0724600 | 02001e57 | 000adefc | 00000203 | 020024df | 000adf08 | 00000203 | 000092e3 | 000adf1a | 000007d3 | 00000007 | 0016a163 | 000adf2a |
| 0724660 | 00048243 | 00000007 | 0200095f | 00000003 | 0000000b | 02000cdf | 0000001f | 00002377 | 01002d67 | 0000000b | 0100147f | 000adf79 |
| 0724740 | 02000ce7 | 000adf51 | 00002aff | 02000ce7 | 000adf71 | 00002aff | 0100147f | 000adf79 | 01002d67 | 0000000b | 0000000b | 00000007 |
| 0725020 | 0100147f | 000adfb1 | 02000ce7 | 000adf89 | 00002aff | 02000ce7 | 000adfa9 | 00002aff | 0100147f | 000adfb1 | 01002d67 | 0000000b |
| 0725100 | 0000000b | 000adf82 | 0100147f | 00000007 | 02000ce7 | 000adfc1 | 00002aff | 02000ce7 | 000adfe1 | 00002aff | 0100147f | 00000007 |
| 0725160 | 0000017b | 000adff2 | 00000343 | 000adffa | 0000037b | 000ae002 | 0000036b | 000ae00a | 0000032b | 000ae012 | 0000017b | 000ae01a |
| 0725240 | 0000037b | 000ae022 | 0000039b | 000ae02a | 0000030b | 000ae032 | 0000039b | 000ae03a | 0000018b | 000ae042 | 0000017b | 000ae04a |
| 0725320 | 0000030b | 000ae052 | 0000017b | 000ae05a | 0000039b | 000ae062 | 00000393 | 000ae06a | 0000032b | 000ae072 | 0000032b | 000ae07a |
| 0725400 | 0000017b | 000ae082 | 00000383 | 000ae08a | 00000393 | 000ae092 | 0000037b | 000ae09a | 00000363 | 000ae0a2 | 0000037b | 000ae0aa |
| 0725460 | 0000033b | 000ae0b2 | 0000016b | 000ae0ba | 000003a3 | 000ae0c2 | 00000393 | 000ae0ca | 0000034b | 000ae0d2 | 0000030b | 000ae0da |
| 0725540 | 00000363 | 000ae0e2 | 0000039b | 000ae0ea | 0000017b | 000ae0f2 | 00000323 | 000ae0fa | 0000031b | 000ae102 | 000003a3 | 000ae10a |
| 0725620 | 0000033b | 000ae112 | 0000017b | 000ae11a | 00000323 | 000ae122 | 0000031b | 000ae12a | 000003a3 | 000ae132 | 0000033b | 000ae13a |
| 0725700 | 0000018b | 000ae142 | 0000017b | 000ae14a | 000003a3 | 000ae152 | 00000343 | 000ae15a | 0000032b | 000ae162 | 0000030b | 000ae16a |
| 0725760 | 00000323 | 000ae172 | 00000173 | 000ae17a | 00000383 | 000ae182 | 00000363 | 00000007 | 0000017b | 000ae14a | 000ae196 | 0000017b |
| 0726040 | 000ae19e | 00000343 | 000ae1a6 | 0000037b | 000ae1ae | 0000036b | 000ae1b6 | 0000032b | 000ae1be | 0000017b | 000ae1c6 | 0000037b |
| 0726120 | 000ae1ce | 0000039b | 000ae1d6 | 0000030b | 000ae1de | 0000039b | 000ae1e6 | 0000018b | 000ae1ee | 0000017b | 000ae1f6 | 0000030b |
| 0726200 | 000ae1fe | 0000017b | 000ae206 | 0000039b | 000ae20e | 00000393 | 000ae216 | 0000032b | 000ae21e | 0000032b | 000ae226 | 0000017b |
| 0726260 | 000ae22e | 00000383 | 000ae236 | 00000393 | 000ae23e | 0000037b | 000ae246 | 00000363 | 000ae24e | 0000037b | 000ae256 | 0000033b |
| 0726340 | 000ae25e | 0000016b | 000ae266 | 000003a3 | 000ae26e | 00000393 | 000ae276 | 0000034b | 000ae27e | 0000030b | 000ae286 | 00000363 |
| 0726420 | 000ae28e | 0000039b | 000ae296 | 0000017b | 000ae29e | 00000323 | 000ae2a6 | 0000031b | 000ae2ae | 000003a3 | 000ae2b6 | 0000033b |
| 0726500 | 000ae2be | 0000017b | 000ae2c6 | 00000323 | 000ae2ce | 0000031b | 000ae2d6 | 000003a3 | 000ae2de | 0000033b | 000ae2e6 | 0000018b |
| 0726560 | 00000007 | 00001d4f | 00000007 | 0000328f | 000ae2ee | 00000103 | 000ae2f6 | 00000013 | 000ae2fe | 00000c83 | 00000007 | 000007d3 |
| 0726640 | 000ae30e | 0000315f | 000ae379 | 000001e3 | 00002367 | 00001d57 | 0500236f | 000ae32c | 000ae328 | 000ae324 | 000ae320 | 000ae31c |
| 0726720 | 02000ce7 | 000ae331 | 00002aff | 02000ce7 | 000ae361 | 00002aff | 0500236f | 00001d57 | 00002367 | 000001e3 | 000ae379 | 0000315f |
| 0727000 | 0200095f | 00000023 | 00000023 | 01002b4f | 00002c07 | 02000ce7 | 000ae385 | 00002aff | 02000ce7 | 000ae3a5 | 00002aff | 01002b4f |
| 0727060 | 00002c07 | 01002a27 | 000000cb | 01002a27 | 00000033 | 01002a27 | 0000007b | 03002427 | 000ae3ad | 000ae3b5 | 000ae3bd | 000ae3bd |
| 0727140 | 00000007 | 000ae3b5 | 000ae3d6 | 000ae3ad | 000ae3de | 00001dff | 000ae3e6 | 0000315f | 000001e3 | 00002367 | 00001d57 | 0500236f |
| 0727220 | 000ae400 | 000ae3fc | 000ae3f8 | 000ae44d | 000ae3f4 | 02000ce7 | 000ae405 | 00002aff | 02000ce7 | 000ae435 | 00002aff | 0500236f |
| 0727300 | 00001d57 | 00002367 | 000001e3 | 000ae44d | 0000315f | 0200095f | 00000023 | 00000023 | 00003157 | 0007fa2c | 000ae41d | 000ae430 |
| 0727360 | 000ae424 | 00000001 | 000ae449 | 000ae418 | 00000001 | 000ae482 | 00000003 | 00000007 | 0200095f | 00000003 | 0000000b | 000ae494 |
| 0727440 | 00000183 | 00000007 | 000001ab | 000ae49a | 00000193 | 000ae4a2 | 00000183 | 00000007 | 00000183 | 000ae4b2 | 000001a3 | 000ae4ba |
| 0727520 | 00000007 | 000ae4bc | 00000203 | 000ae4b8 | 000ae4b4 | 02000ce7 | 000ae4c5 | 00002aff | 02000ce7 | 000ae4f5 | 00002aff | 0500236f |
| 0727600 | 00001d57 | 00002367 | 00000203 | 000ae50d | 0000315f | 0200095f | 00000063 | 0000002b | 05001b0f | 00003217 | 00000033 | 00002c07 |
| 0727660 | 00523583 | 00000203 | 02000ce7 | 000ae519 | 00002aff | 02000ce7 | 000ae549 | 00002aff | 05001b0f | 00003217 | 00000033 | 00002c07 |
| 0727740 | 00523583 | 00000203 | 02000a3f | 000ae56d | 000ae575 | 0100088f | 000006a7 | 02000a3f | 000ae5e9 | 000ae581 | 02000a3f | 000ae58d |
| 0730020 | 000ae59d | 0100088f | 000ae595 | 010021d7 | 00002cc7 | 02000a3f | 000ae765 | 000ae5a9 | 0100088f | 000002bf | 02000a3f | 000ae2e9 |
| 0730100 | 000ae5bd | 02000c4f | 00001c67 | 000ae3f1 | 06003217 | 000aec61 | 000aec91 | 000aecc1 | 000aecf1 | 000aed21 | 000aed51 | 00002cc7 |
| 0730160 | 02000a3f | 000ae625 | 000ae605 | 00002cc7 | 02000abf | 000020bf | 00000033 | 02000d27 | 000ae5f9 | 000ae611 | 0300260f | 00001faf |
| 0730240 | 000adf74 | 00002b97 | 00002cc7 | 02000a3f | 000ae661 | 000ae641 | 00002cc7 | 02000abf | 000020bf | 0000002b | 02000d27 | 000ae635 |
| 0730320 | 000ae64d | 0300260f | 00001faf | 000adf38 | 00002b97 | 00002cc7 | 02000a3f | 000ae69d | 000ae67d | 00002cc7 | 02000abf | 000020bf |
| 0730400 | 00000023 | 02000d27 | 000ae671 | 000ae689 | 0300260f | 00001faf | 000adefc | 00002b97 | 00002cc7 | 02000a3f | 000ae6d9 | 000ae6b9 |
| 0730460 | 00002cc7 | 02000abf | 000020bf | 0000001b | 02000d27 | 000ae6ad | 000ae6c5 | 0300260f | 00001faf | 000adec0 | 00002b97 | 00002cc7 |
| 0730540 | 02000a3f | 000ae715 | 000ae6f5 | 00002cc7 | 02000abf | 000020bf | 00000013 | 02000d27 | 000ae6e9 | 000ae701 | 0300260f | 00001faf |
| 0730620 | 000ade74 | 00002b97 | 00002cc7 | 02000a3f | 00002cc7 | 000ae731 | 00002cc7 | 02000abf | 000020bf | 0000000b | 02000d27 | 000ae725 |
| 0730700 | 000ae73d | 0300260f | 00001faf | 000ade30 | 00002b97 | 00002cc7 | 0100088f | 000002bf | 02000a57 | 00002c07 | 00000007 | 02000a3f |
| 0730760 | 000ae771 | 000ae819 | 02000a3f | 000ae7a1 | 000ae77d | 0300088f | 00001c67 | 000ae78d | 000afc21 | 030026f7 | 00002327 | 00000013 |
| 0731040 | 00002c07 | 00002cc7 | 02000a3f | 000ae7bd | 000ae7dd | 00002cc7 | 02000abf | 0000275f | 00000013 | 02000d27 | 000ae7b1 | 000ae7c9 |
| 0731120 | 0300260f | 00001faf | 000ae004 | 00002b97 | 00002cc7 | 02000a3f | 000ae7f9 | 00002cc7 | 00002cc7 | 02000abf | 0000275f | 0000000b |
| 0731200 | 02000d27 | 000ae7ed | 000ae805 | 0300260f | 000003ef | 000adf38 | 0000238f | 00002cc7 | 02000a3f | 000ae849 | 000ae825 | 0300088f |
| 0731260 | 00001c67 | 000ae835 | 000afb8d | 030026f7 | 00003187 | 0000001b | 00001c67 | 00002cc7 | 02000a3f | 000ae865 | 000ae885 | 00002cc7 |
| 0731340 | 02000abf | 0000275f | 0000001b | 02000d27 | 000ae859 | 000ae871 | 0300260f | 000003ef | 000adf74 | 0000238f | 00002cc7 | 02000a3f |
| 0731420 | 000ae8a1 | 000aebdd | 00002cc7 | 02000abf | 0000275f | 00000013 | 02000a3f | 000ae905 | 000ae8ad | 02000a3f | 000ae8b9 | 000ae8e5 |
| 0731500 | 02000d27 | 000ae8c5 | 000ae8d1 | 02000abf | 0000275f | 00000013 | 01002037 | 000ae8d9 | 02000abf | 0000000f | 00000013 | 02000a3f |
| 0731560 | 000ae8f9 | 000ae8f1 | 0100088f | 000001b7 | 02000a3f | 000aeaad | 000ae911 | 02000a3f | 000aeab9 | 000ae92d | 02000d27 | 00002cef |
| 0731640 | 000ae91d | 0300260f | 000003ef | 000af229 | 000020e7 | 02000a3f | 000ae995 | 000ae939 | 02000a3f | 000ae945 | 000ae975 | 02000d27 |

```
0731720  000ae951 000ae965 01002cef 000ae959 02000abf 0000000f 00000013 0300260f 00001faf 000ae924 00002b97 02000a3f
0732000  000ae989 000ae981 0100088f 000001b7 02000a3f 000aea79 000ae9a1 02000a3f 000aea85 000ae9bd 02000d27 00002cef
0732060  000ae9ad 0300260f 000003ef 000af1fd 000020e7 02000a3f 000aea25 000ae9c9 02000a3f 000ae9d5 000aea05 02000d27
0732140  000ae9e1 000ae9f5 01002cef 000ae9e9 02000abf 0000000f 00000013 0300260f 00001faf 000ae9b4 00002b97 02000a3f
0732220  000aea19 000aea11 0100088f 000001b7 02000a3f 000aea45 000aea31 02000a3f 000aea51 00002cc7 02000d27 00002cef
0732300  000aea3d 01001d6f 00000007 02000a3f 00002cc7 000aea5d 02000a3f 00002cc7 00002cc7 02000d27 00002cef 000aea69
0732360  0300260f 000003ef 000adefc 0000238f 02000a3f 00002cc7 000aea91 02000a3f 00002cc7 00002cc7 02000d27 00002cef
0732440  000aea9d 0300260f 000003ef 000adec0 0000238f 02000a3f 00002cc7 000aeac5 02000a3f 00002cc7 000aeae1 02000d27
0732520  00002cef 000aead1 0300260f 000003ef 000af1c1 000020e7 02000a3f 000aeb49 000aeaed 02000a3f 000aeaf9 000aeb29
0732600  02000d27 000aeb05 000aeb19 01002cef 000aeb0d 02000abf 00003287 0000001b 00076c69 73742e70 6c000000 000032f7
0732660  b328ffff 000acbe0 00000000 28c4147d 000aeb58 2ca02aff 00000004 00000002 000a67c8 000aeb58 0002438a 0009eca8
0732740  29540010 0002438a 57586b49 5370228c 00282f68 6f6d652f 6f736173 312f612f 73726565 2f73656d 616e7469 635f6368
0733020  65636b31 2f73746d 747300ff 002b2f68 6f6d652f 6f736173 312f612f 73726565 2f73656d 616e7469 635f6368 65636b31
0733100  2f73746d 74732e70 6c005f6f 0000002c 000d81b0 b27cb66c 00000440 7fffffff 0009cd90 02000ce5 0200293d 0000435f
0733160  000002a3 00002aff 0000002c 000d81dc b27cb66c 000004aa 7fffffff 0009dc84 02000ce5 02001f6d 0000435f 00002c07
0733240  00002aff 000f7363 616c6172 5f747970 655f6465 66000000 000aed34 0000002c b27cb66c 00000442 000004a9 0009cbc1
0733320  02000ce5 02002385 0000435f 00002c07 00002aff 000000d4 000a3840 b27cb66c 00000443 7fffffff 000aeea4 02000ce5
0733400  020031ed 020031e5 00004097 02000a3d 02000885 00004367 0000000c 02000885 0000436f 00000010 02000a3d 020031f5
0733460  02003ebd 00000014 00000001 00000018 0000001c 02000a3d 02000885 0000000e 02003ebd 00000016 0000001a 02000885
0733540  00000012 02003ebd 00000016 0000001e 020031f5 02004375 00000016 00000001 0000001a 0000001e 02000a3d 02000885
0733620  0000000e 02004375 00000016 0000001a 02000885 00000012 02004375 00000016 0000001e 00002aff 000aeffc 00000064
0733700  b27cb66c 00000444 000004ab 000af000 02000ce5 05001b0d 00004097 0000001b 00002c07 0067bec3 000002a3 00002aff
0733760  000aeffc 0000002c b4f0b4e4 00000443 7fffffff 0007eaad 00000000 00000000 000a939c 0002438a 000db43c 27f00108
0734040  000aeee8 5d100000 03003287 4b8c0000 00004097 60cc56f8 671c55f0 682c5370 58186530 001c5c30 020031f7 65300024
0734120  5e540000 02003ebf 67ec0018 55f06670 00205ec0 00000024 02000a3f 66c00028 00245ec0 00000028 02000887 6b7458e0
0734200  02003ebf 6c840018 6c840020 5c9c0024 02000887 6d3c58e0 02003ebf 6c840018 6c345878 001c67ec 001c5370 5c9c001c
0734260  020031f7 66c00024 001c5ec0 00000024 02004377 6c840018 55f06c84 00206c34 5c9c001c 02000a3f 66c00024 001c5ec0
0734340  00000024 02000887 6b7458e0 02004377 6c840018 6c840020 5c9c001c 02000887 6d3c58e0 02004377 6c840018 6c344768
0734420  33bc247c 000da140 0018386c 3d302340 000da160 0000004c 000aec64 b27cb66c 00000445 7fffffff 000aef2c 02000ce5
0734500  020031ed 020031e5 00004097 00000007 02000a3d 02003ebd 0000000c 00000007 02004375 00000010 00000007 00002aff
0734560  2954003c 0002438a 5d100000 03003287 4b8c0000 00004097 537055f0 64205c30 02003ebf 5fa05370 56f8671c 53705aec
0734640  02004377 5fa05370 4960228c 000000d4 000aeea4 b27cb66c 00000446 7fffffff 000af140 02000ce5 020031ed 020031e5
0734720  0000436f 02000a3d 02000885 00004367 0000000c 02000885 0000436f 00000010 02000a3d 020031f5 02003ebd 00000014
0735000  00000001 00000018 0000001c 02000a3d 02000885 0000000e 02003ebd 00000016 0000001a 02000885 00000012 02003ebd
0735060  00000016 0000001e 020031f5 02004375 00000016 00000001 0000001a 0000001e 02000a3d 02000885 0000000e 02004375
0735140  00000016 0000001a 02000885 00000012 02004375 00000016 0000001e 00002aff 000af370 00000038 b27cb66c 00000447
0735220  000004ac 000af374 02000ce5 05001b0d 0000436f 0000001b 00002c07 006d0b03 000002a3 00002aff 27f00108 000af184
0735300  5d100000 03003287 4b8c0000 0000436f 60cc56f8 671c55f0 682c5370 58186530 001c5c30 020031f7 65300024 5e540000
0735360  02003ebf 67ec0018 55f06670 00205ec0 00000024 02000a3f 66c00028 00245ec0 00000028 02000887 6b7458e0 02003ebf
0735440  6c840018 6c840020 5c9c0024 02000887 6d3c58e0 02003ebf 6c840018 6c345878 001c67ec 001c5370 5c9c001c 020031f7
0735520  66c00024 001c5ec0 00000024 02004377 6c840018 55f06c84 00206c34 5c9c001c 02000a3f 66c00024 001c5ec0 00000024
0735600  02000887 6b7458e0 02004377 6c840018 6c840020 5c9c001c 02000887 6d3c58e0 02004377 6c840018 6c344768 33bc247c
0735660  000da140 0018386c 3d302340 000da160 0000004c 000aef2c b27cb66c 00000448 7fffffff 000af1c8 02000ce5 020031ed
0735740  020031e5 0000436f 00000007 02000a3d 02003ebd 0000000c 00000007 02004375 00000010 00000007 00002aff 2954003c
0736020  0002438a 5d100000 03003287 4b8c0000 0000436f 537055f0 64205c30 02003ebf 5fa05370 56f8671c 53705aec 02004377
0736100  5fa05370 4960228c 000001ac 000af140 b27cb66c 00000449 7fffffff 000af664 02000ce5 020031ed 020031e5 00004367
0736160  02000a3d 02003645 000033ff 0000000c 02000a3d 02000885 00003b3f 00000010 02000a3d 02003645 0000226f 00000014
0736240  02000a3d 02000885 0000437f 00000018 02000a3d 02000885 00004387 0000001c 02000a3d 02003645 00003437 00000020
0736320  02000a3d 02003645 000033ff 00000024 0100371d 00000026 02000a3d 020031f5 02003ebd 00000029 02003ac5 0000000e
0736400  04004365 000033ff 0000002c 00000030 00000034 02000a3d 02000885 00000012 02003ff5 0000002a 0000002e 02000a3d
0736460  02000885 0000001a 02003ebd 0000002a 00000032 02000a3d 02000885 0000001e 02003ebd 0000002a 00000036 02000cdd
0736540  0000002a 01001b85 02003ac5 0000000e 04004365 000033ff 0000002e 00000032 00000036 020031f5 02004375 0000002a
0736620  02003ac5 0000000e 04004365 000033ff 0000002e 00000032 00000036 02000a3d 02000885 00000012 02003ff5 0000002a
0736700  0000002e 02000a3d 02000885 0000001a 02003ebd 0000002a 00000032 02000885 0000001e 02003ebd 0000002a 00000036
0736760  00002aff 000b0ae0 00000039 b27cb66c 0000044a 000004ad 000a591c 02000ce5 05001b0d 00004367 0000001b 00002c07
```

| | | | | | | | | | | | | |
|---|---|---|---|---|---|---|---|---|---|---|---|---|
| 0737040 | 006d0a03 | 000002a3 | 00002aff | 27f002b8 | 000af830 | 5d100000 | 03003287 | 4b8c0000 | 00004367 | 64205818 | 67ec001c | 55f0687c |
| 0737120 | 004455f0 | 6af0003c | 55f06af0 | 003455f0 | 6af0002c | 55f06af0 | 002455f0 | 6af0001c | 55f06a00 | 537056f8 | 61100020 | 5d100000 |
| 0737200 | 020031f7 | 6110002c | 5d100000 | 02003ebf | 67ec0018 | 5a180000 | 02003ac7 | 671c58e0 | 04004367 | 4b8c0000 | 000033ff | 67ec0028 |
| 0737260 | 66700024 | 5c9c002c | 02000a3f | 66c00030 | 002c5ec0 | 00000030 | 02000887 | 6e580044 | 5a180000 | 02003ff7 | 6c840018 | 6c840028 |
| 0737340 | 5c9c002c | 02000a3f | 66c00030 | 002c5ec0 | 00000030 | 02000887 | 6e580034 | 5a180000 | 02003ebf | 6c840018 | 6c840024 | 5c9c002c |
| 0737420 | 02000a3f | 66c00030 | 002c5ec0 | 00000030 | 02000887 | 6e58002c | 5a180000 | 02003ebf | 6c840018 | 6c345ec0 | 0000002c | 02000cdf |
| 0737500 | 6c840018 | 5a180000 | 01001b87 | 5a180000 | 02003ac7 | 6b7458e0 | 04004367 | 4b8c0000 | 000033ff | 6c840028 | 6c840024 | 6c345878 |
| 0737560 | 002067ec | 00205370 | 5c9c0020 | 020031f7 | 66c0002c | 00205ec0 | 0000002c | 02004377 | 6c840018 | 5a180000 | 02003ac7 | 6b7458e0 |
| 0737640 | 04004367 | 4b8c0000 | 000033ff | 6c840028 | 6c840024 | 6c345ec0 | 00000020 | 02000a3f | 66c0002c | 00205ec0 | 0000002c | 02000887 |
| 0737720 | 6e580044 | 5a180000 | 02003ff7 | 6c840018 | 6c840028 | 5c9c0020 | 02000a3f | 66c00028 | 00205ec0 | 00000028 | 02000887 | 6e580034 |
| 0740000 | 5a180000 | 02003ebf | 6c840018 | 6c840024 | 5c9c0020 | 02000887 | 6e58002c | 5a180000 | 02003ebf | 6c840018 | 6c3436a4 | 477c3540 |
| 0740060 | 00180048 | 3678001c | 35c842ac | 000033ff | 000cc5cc | 004c3410 | 00403e70 | 00483c9c | 00000044 | 000d72f4 | 00443540 | 00180038 |
| 0740140 | 3f680040 | 3894003c | 320c42ac | 0000226f | 000cc5cc | 003c3410 | 00303e70 | 00383c9c | 00000034 | 000da1d0 | 00343410 | 00283e70 |
| 0740220 | 00303c9c | 0000002c | 000da1f0 | 002c3540 | 00180020 | 3f680028 | 38940024 | 320c42ac | 00003437 | 000cc5cc | 00243500 | 00183f68 |
| 0740300 | 00203894 | 001c3310 | 43000000 | 000033ff | 000cc5cc | 001c38e8 | 346c37f0 | 3cf4234c | 000cc8c0 | 000001d4 | 000af1c8 | b27cb66c |
| 0740360 | 0000044b | 7fffffff | 000afaf4 | 02000ce5 | 020031ed | 020031e5 | 00004367 | 02000a3d | 02003645 | 0000214f | 0000000c | 02000a3d |
| 0740440 | 02000885 | 0000438f | 00000010 | 02000a3d | 02003645 | 00003517 | 00000014 | 02000a3d | 0000083f | 02000a3d | 02000885 | 00004097 |
| 0740520 | 00000018 | 02000a3d | 02000885 | 00004397 | 0000001c | 02000885 | 0000439f | 00000020 | 02000a3d | 020031f5 | 02003ebd | 00000024 |
| 0740600 | 02003ac5 | 0000000e | 05004365 | 0000214f | 00000028 | 0000002c | 00000030 | 00000034 | 02000a3d | 02000885 | 00000012 | 02003ebd |
| 0740660 | 00000026 | 0000002a | 02000a3d | 02000885 | 0000001a | 02004375 | 00000026 | 0000002e | 02000a3d | 02000885 | 0000001e | 02003ebd |
| 0740740 | 00000026 | 00000032 | 02000a3d | 02000885 | 00000022 | 02003ebd | 00000026 | 00000036 | 02000cdd | 00000026 | 01001b85 | 02003ac5 |
| 0741020 | 0000000e | 05004365 | 0000214f | 0000002a | 0000002e | 00000032 | 00000036 | 020031f5 | 02004375 | 00000026 | 02003ac5 | 0000000e |
| 0741100 | 05004365 | 0000214f | 0000002a | 0000002e | 00000032 | 00000036 | 02000a3d | 02000885 | 00000012 | 02003ebd | 00000026 | 0000002a |
| 0741160 | 02000a3d | 02000885 | 0000001a | 02004375 | 00000026 | 0000002e | 02000a3d | 02000885 | 0000001e | 02003ebd | 00000026 | 00000032 |
| 0741240 | 02000885 | 00000022 | 02003eb1 | 00000026 | 00000036 | 00002aff | 28c402bc | 000afc30 | 5d100000 | 03003287 | 4b8c0000 | 00004367 |
| 0741320 | 64205818 | 67ec001c | 55f0687c | 003055f0 | 6af00028 | 55f06af0 | 002055f0 | 6aa055f0 | 69b05370 | 56f86110 | 00205aec | 020031f7 |
| 0741400 | 61100030 | 5d100000 | 02003ebf | 67ec0018 | 5a180000 | 02003ac7 | 671c58e0 | 05004367 | 4b8c0000 | 0000214f | 66c0002c | 00286670 |
| 0741460 | 00245ec0 | 00000030 | 02000a3f | 66c00034 | 00305ec0 | 00000034 | 02000887 | 6e580030 | 5a180000 | 02003ebf | 6c840018 | 6c84002c |
| 0741540 | 5c9c0030 | 02000a3f | 66c00034 | 00305ec0 | 00000034 | 02000887 | 6e580020 | 5a180000 | 02004377 | 6c840018 | 6c840028 | 5c9c0030 |
| 0741620 | 02000a3f | 66c00034 | 00305ec0 | 00000034 | 02000887 | 6e0858e0 | 02003ebf | 6c840018 | 6c840024 | 5c9c0030 | 02000a3f | 66c00034 |
| 0741700 | 00305ec0 | 00000034 | 02000887 | 6d3c58e0 | 02003ebf | 6c840018 | 6c345ec0 | 00000030 | 02000cdf | 6c840018 | 5a180000 | 01001b87 |
| 0741760 | 5a180000 | 02003ac7 | 6b7458e0 | 05004367 | 4b8c0000 | 0000214f | 6c84002c | 6c840028 | 6c840024 | 6c345878 | 002067ec | 00205370 |
| 0742040 | 5c9c0020 | 020031f7 | 66c00030 | 00205ec0 | 00000030 | 02004377 | 6c840018 | 5a180000 | 02003ac7 | 6b7458e0 | 05004367 | 4b8c0000 |
| 0742120 | 0000214f | 6c84002c | 6c840028 | 6c840024 | 6c345ec0 | 00000020 | 02000a3f | 66c00030 | 00205ec0 | 00000030 | 02000887 | 6e580030 |
| 0742200 | 5a180000 | 02003ebf | 6c840018 | 6c84002c | 5c9c0020 | 02000a3f | 66c0002c | 00205ec0 | 0000002c | 02000887 | 6e580020 | 5a180000 |
| 0742260 | 02004377 | 6c840018 | 6c840028 | 5c9c0020 | 02000a3f | 66c00028 | 00205ec0 | 00000028 | 02000887 | 6e0858e0 | 02003ebf | 6c840018 |
| 0742340 | 6c840024 | 5c9c0020 | 02000887 | 6d3c58e0 | 02003ebf | 6c840018 | 6c3436a4 | 47683540 | 00180034 | 3678001c | 35c842ac | 0000214f |
| 0742420 | 000cc5cc | 00383410 | 002c3e70 | 00343c9c | 00000030 | 000da24c | 00303540 | 00180024 | 3f68002c | 38940028 | 320c42ac | 00003517 |
| 0742500 | 000cc5cc | 00282ecc | 3410001c | 3e700024 | 3af40020 | 000cf7d8 | 002033bc | 3e70001c | 3c480000 | 000da26c | 0018386c | 3d302340 |
| 0742560 | 000da28c | 00000144 | 000af664 | b27cb66c | 0000044c | 7fffffff | 000afe38 | 02000ce5 | 020031ed | 020031e5 | 00004367 | 02000a3d |
| 0742640 | 02000885 | 000043a7 | 0000000c | 02000a3d | 02003645 | 00003477 | 00000010 | 02000a3d | 02000885 | 00004097 | 00000014 | 02000a3d |
| 0742720 | 02003645 | 00003437 | 00000018 | 02000a3d | 02003645 | 00003477 | 0000001c | 0100371d | 0000001e | 02000a3d | 020031f5 | 02003ebd |
| 0743000 | 00000020 | 02003ac5 | 00000012 | 02004365 | 00000024 | 00000028 | 02000a3d | 02000885 | 0000000e | 02003ebd | 00000022 | 00000026 |
| 0743060 | 02000a3d | 02000885 | 00000016 | 02004375 | 00000022 | 0000002a | 02000cdd | 00000022 | 01001b85 | 02003ac5 | 00000012 | 02004365 |
| 0743140 | 00000026 | 0000002a | 020031f5 | 02004375 | 00000022 | 02003ac5 | 00000012 | 02004365 | 00000026 | 0000002a | 02000a3d | 02000885 |
| 0743220 | 0000000e | 02003ebd | 00000022 | 00000026 | 02000885 | 00000016 | 02004375 | 00000022 | 0000002a | 00002aff | 28c40200 | 000aff14 |
| 0743300 | 5d100000 | 03003287 | 4b8c0000 | 00004367 | 60cc56f8 | 671c55f0 | 687c0038 | 55f06af0 | 002c55f0 | 6af00024 | 55f06af0 | 001c55f0 |
| 0743360 | 6a005370 | 58186530 | 001c5c30 | 020031f7 | 65300024 | 5e540000 | 02003ebf | 67ec0018 | 5a180000 | 02003ac7 | 6af00034 | 5a180000 |
| 0743440 | 02004367 | 66700020 | 5c9c0024 | 02000a3f | 66c00028 | 00245ec0 | 00000028 | 02000887 | 6b7458e0 | 02003ebf | 6c840018 | 6c840020 |
| 0743520 | 5c9c0024 | 02000a3f | 66c00028 | 00245ec0 | 00000028 | 02000887 | 6e58002c | 5a180000 | 02004377 | 6c840018 | 6c345ec0 | 00000024 |
| 0743600 | 02000cdf | 6c840018 | 5a180000 | 01001b87 | 5a180000 | 02003ac7 | 6e580034 | 5a180000 | 02004367 | 6c840020 | 6c345878 | 001c67ec |
| 0743660 | 001c5370 | 5c9c001c | 020031f7 | 66c00024 | 001c5ec0 | 00000024 | 02004377 | 6c840018 | 5a180000 | 02003ac7 | 6e580034 | 5a180000 |
| 0743740 | 02004367 | 6c840020 | 6c345ec0 | 0000001c | 02000a3f | 66c00024 | 001c5ec0 | 00000024 | 02000887 | 6b7458e0 | 02003ebf | 6c840018 |
| 0744020 | 6c840020 | 5c9c001c | 02000887 | 6e58002c | 5a180000 | 02004377 | 6c840018 | 6c34477c | 3410003c | 24d00000 | 000da2ac | 00403540 |
| 0744100 | 00180030 | 3f68003c | 38940038 | 392c0034 | 43000000 | 00003477 | 000cc5cc | 00343410 | 00283e70 | 00303c9c | 0000002c | 000cf7d8 |

```
0744160 002c3540 00180020 3f680028 38940024 320c42ac 00003437 000cc5cc 00243500 00181f68 00203894 001c3310 43000000
0744240 00003477 000cc5cc 001c38e8 346c37f0 3cf4234c 000cc9c0 000000e4 000afaf4 b27cb66c 00000441 7fffffff 000b006c
0744320 02000ce5 020031ed 020031e5 00004367 02000a3d 02003645 000034ef 0000000c 02000a3d 02000885 00003b3f 00000010
0744400 0100371d 0000000e 02000a3d 020031f5 02003ebd 00000014 02003ac5 0000000e 02004365 000034ef 00000018 02000a3d
0744460 02000885 00000012 02003ff5 00000016 0000001a 02000cdd 00000016 01001b85 02003ac5 0000000e 02004365 000034ef
0744540 0000001a 020031f5 02004375 00000016 02003ac5 0000000e 02004365 000034ef 0000001a 02000885 00000012 02003ff5
0744620 00000016 0000001a 00002aff 28c40150 000b01e0 5d100000 03003287 4b8c0000 00004367 60cc56f8 671c55f0 687c001c
0744700 55f06a00 53705818 6530001c 5e540000 020031f7 65300020 5e540000 02003ebf 67ec0018 5a180000 02003ac7 69b058e0
0744760 02004367 4b8c0000 000034ef 67b85ec0 00000020 02000a3f 66c00024 00205ec0 00000024 02000887 6e58001c 5a180000
0745040 02003ff7 6c840018 6c345ec0 00000020 02000cdf 6c840018 5a180000 01001b87 5a180000 02003ac7 6d3c58e0 02004367
0745120 4b8c0000 000034ef 6c345878 001c67ec 001c5370 5c9c001c 020031f7 66c00020 001c5ec0 00000020 02004377 6c840018
0745200 5a180000 02003ac7 6d3c58e0 02004367 4b8c0000 000034ef 6c345ec0 0000001c 02000887 6e58001c 5a180000 02003ff7
0745260 6c840018 6c3436a4 477c3540 00180020 362c37dc 43000000 000034ef 000cc5cc 002433d8 3e700020 3af4001c 000d72f4
0745340 001c38e8 346c2330 000cc8c0 0000017c 000afe38 b27cb66c 0000044e 7fffffff 000b0430 02000ce5 020031ed 020031e5
0745420 00004367 02000a3d 02003645 00003557 0000000c 02000a3d 02000885 000043af 00000010 02000a3d 02000885 000043b7
0745500 00000014 02000a3d 02000885 000043bf 00000018 0100371d 0000000e 02000a3d 020031f5 02003ebd 0000001c 02003ac5
0745560 0000000e 04004365 00003557 00000020 00000024 00000028 02000a3d 02000885 00000012 02003ebd 0000001e 00000022
0745640 02000a3d 02000885 00000016 02003ebd 0000001e 00000026 02000a3d 02000885 0000001a 02003ebd 0000001e 0000002a
0745720 02000cdd 0000001e 01001b85 02003ac5 0000000e 04004365 00003557 00000022 00000026 0000002a 020031f5 02004375
0746000 0000001e 02003ac5 0000000e 04004365 00003557 00000022 00000026 0000002a 02000a3d 02000885 00000012 02003ebd
0746060 0000001e 00000022 02000a3d 02000885 00000016 02003ebd 0000001e 00000026 02000885 0000001a 02003ebd 0000001e
0746140 0000002a 00002aff 28c40248 000b0558 51100000 03003287 4b8c0000 00004367 60cc56f8 671c55f0 687c002c 55f06af0
0746220 002455f0 6af0001c 55f06a00 53705818 6530001c 5e540000 020031f7 65300028 5e540000 02003ebf 67ec0018 5a180000
0746300 02003ac7 69b058e0 04004367 4b8c0000 00003557 67ec0024 66700020 5c9c0028 02000a3f 66c0002c 00285ec0 0000002c
0746360 02000887 6e58002c 5a180000 02003ebf 6c840018 6c840024 5c9c0028 02000a3f 66c0002c 00285ec0 0000002c 02000887
0746440 6e580024 5a180000 02003ebf 6c840018 6c840020 5c9c0028 02000a3f 66c0002c 00285ec0 0000002c 02000887 6e58001c
0746520 5a180000 02003ebf 6c840018 6c345ec0 00000028 02000c4f 6c840018 5a180000 01001b87 5a180000 02003ac7 6d3c58e0
0746600 04004367 4b8c0000 00003557 6c840024 6c840020 6c345878 001c67ec 001c5370 5c9c001c 020031f7 66c00028 001c5ec0
0746660 00000028 02004377 6c840018 5a180000 02003ac7 6d3c58e0 04004367 4b8c0000 00003557 6c840024 6c840020 6c345ec0
0746740 0000001c 02000a3f 66c00028 001c5ec0 00000028 02000887 6e58002c 5a180000 02003ebf 6c840018 6c840024 5c9c001c
0747020 02000a3f 66c00024 001c5ec0 00000024 02000887 6e580024 5a180000 02003ebf 6c840018 6c840020 5c9c001c 02000887
0747100 6e58001c 5a180000 02003ebf 6c840018 6c3436a4 477c3540 00180030 362c37dc 43000000 00003557 000cc5cc 00343410
0747160 00283e70 00303c9c 0000002c 000da330 002c3410 00203e70 00283c9c 00000024 000da350 002433d8 3e700020 3af4001c
0747240 000da370 001c38e8 346c2330 000cc8c0 00000130 000b006c b27cb66c 0000044f 7fffffff 000b0728 02000ce5 020031ed
0747320 020031e5 00004367 02000a3d 02003645 00001b77 0000000c 02000a3d 02000885 0000438f 00000010 02000a3d 02000885
0747400 000043c7 00000014 0100371d 0000000e 02000a3d 020031f5 02003ebd 00000018 02003ac5 0000000e 03004365 00001b77
0747460 0000001c 00000020 02000a3d 02000885 00000012 02003ebd 0000001a 0000001e 02000a3d 02000885 00000016 02003ebd
0747540 0000001a 00000022 02000cdd 0000001a 01001b85 02003ac5 0000000e 03004365 00001b77 0000001e 00000022 020031f5
0747620 02004375 0000001a 02003ac5 0000000e 03004365 00001b77 0000001e 00000022 02000a3d 02000885 00000012 02003ebd
0747700 0000001a 0000001e 02000885 00000016 02003ebd 0000001a 00000022 00002aff 28c401c8 000b0804 5d100000 03003287
0747760 4b8c0000 00004367 60cc56f8 671c55f0 687c0024 55f06af0 001c55f0 6a005370 58186530 001c5c30 020031f7 65300024
0750040 5e540000 02003ebf 67ec0018 5a180000 02003ac7 69b058e0 03004367 4b8c0000 00001b77 66700020 5c9c0024 02000a3f
0750120 66c00028 00245ec0 00000028 02000887 6e580024 5a180000 02003ebf 6c840018 6c840020 5c9c0024 02000a3f 66c00028
0750200 00245ec0 00000028 02000887 6e58001c 5a180000 02003ebf 6c840018 6c345ec0 00000024 02000cdf 6c840018 5a180000
0750260 01001b87 5a180000 02003ac7 6d3c58e0 01004367 4b8c0000 00001b77 6c840020 6c345878 001c67ec 001c5370 5c9c001c
0750340 020031f7 66c00024 001c5ec0 00000024 02004377 6c840018 5a180000 02003ac7 6d3c58e0 03004367 4b8c0000 00001b77
0750420 6c840020 6c345ec0 0000001c 02000a3f 66c00024 001c5ec0 00000024 02000887 6e580024 5a180000 02003ebf 6c840018
0750500 6c840020 5c9c001c 02000887 6e58001c 5a180000 02003ebf 6c840018 6c3436a4 477c3540 00180028 362c37dc 43000000
0750560 00001b77 000cc5cc 002c3410 00203e70 00283c9c 00000024 000da24c 002433d8 3e700020 3af4001c 000da3a8 001c38e8
0750640 346c2330 000cc8c0 000000e4 000b0430 b27cb66c 00000450 7fffffff 000b095c 02000ce5 020031ed 020031e5 00004367
0750720 02000a3d 02003645 0000251f 0000000c 02000a3d 02000885 000043cf 00000010 0100371d 0000000e 02000a3d 020031f5
0751000 02003ebd 00000014 02003ac5 0000000e 02004365 0000251f 00000018 02000a3d 02000885 00000012 02003ebd 00000016
0751060 0000001a 02000cdd 00000016 01001b85 02003ac5 0000000e 02004365 0000251f 0000001a 020031f5 02004375 00000016
0751140 02003ac5 0000000e 02004365 0000251f 0000001a 02000885 00000012 02003ebd 00000016 0000001a 00002aff 28c40150
0751220 000a38c8 5d100000 03003287 4b8c0000 00004367 60cc56f8 671c55f0 687c001c 55f06a00 53705818 6530001c 5e540000
```

| | | | | | | | | | | | | |
|---|---|---|---|---|---|---|---|---|---|---|---|---|
| 0751300 | 020031f7 | 65300020 | 5e540000 | 02003ebf | 67ec0018 | 5a180000 | 02003ac7 | 69b058e0 | 02004367 | 4b8c0000 | 0000251f | 67b85ec0 |
| 0751360 | 00000020 | 02000a3f | 66c00024 | 00205ec0 | 00000024 | 02000887 | 6e58001c | 5a180000 | 02003ebf | 6c840018 | 6c345ec0 | 00000020 |
| 0751440 | 02000cdf | 6c840018 | 5a180000 | 01001b87 | 5a180000 | 02003ac7 | 6d3c58e0 | 02004367 | 4b8c0000 | 0000251f | 6c345878 | 001c67ec |
| 0751520 | 001c5370 | 5c9c001c | 020031f7 | 66c00020 | 001c5ec0 | 00000020 | 02004377 | 6c840018 | 5a180000 | 02003ac7 | 6d3c58e0 | 02004367 |
| 0751600 | 4b8c0000 | 0000251f | 6c345ec0 | 0000001c | 02000887 | 6e58001c | 5a180000 | 02003ebf | 6c840018 | 6c3436a4 | 477c3540 | 00180020 |
| 0751660 | 362c37dc | 43000000 | 0000251f | 000cc5cc | 002433d8 | 3e700020 | 3af4001c | 000da3f4 | 001c38e8 | 3d6c2330 | 000cc8c0 | 000000e4 |
| 0751740 | 000b0728 | b27cb66c | 00000451 | 7fffffff | 000a3a20 | 02000ce5 | 020031ed | 020031e5 | 00004367 | 02000a3d | 02003645 | 00001ee7 |
| 0752020 | 0000000c | 02000a3d | 02000885 | 000043cf | 00000010 | 0100371d | 0000000e | 02000a3d | 020031f5 | 02003ebd | 00000014 | 02003ac5 |
| 0752100 | 0000000e | 02004365 | 00001ee7 | 00000018 | 02000a3d | 02000885 | 00000012 | 02003ebd | 00000016 | 0000001a | 02000cdd | 00000016 |
| 0752160 | 01001b85 | 02003ac5 | 0000000e | 02004365 | 00001ee7 | 0000001a | 020031f5 | 02004375 | 00000016 | 02003ac5 | 0000000e | 02004365 |
| 0752240 | 00001ee7 | 0000001a | 02000885 | 00000012 | 02003ebd | 00000016 | 0000001a | 00002aff | 2c7800a4 | 0002438a | 5d100000 | 03003287 |
| 0752320 | 4b8c0000 | 0000441f | 64205818 | 67ec001c | 55f06868 | 55f069b0 | 537056f9 | 671c5370 | 5d100000 | 020031f7 | 61100020 | 5d100000 |
| 0752400 | 02003ff7 | 67ec0019 | 55f0671c | 55f067b8 | 53705ec0 | 00000020 | 02000887 | 6d3c58e0 | 02004007 | 6c840018 | 6c3436a4 | 47683540 |
| 0752460 | 0018001c | 3678001c | 320c247c | 000cc5cc | 002034e0 | 00183f68 | 001c3880 | 320c42ac | 00002197 | 000cc5cc | 0018386c | 3d302340 |
| 0752540 | 000da91c | 000b0c44 | 00000038 | b27cb66c | 0000046f | 000004b7 | 000a6c78 | 02000ce5 | 05001b0d | 000043c7 | 0000001b | 00002c07 |
| 0752620 | 006d1d43 | 000002a3 | 00002aff | 28c4004c | 000a0d78 | 5d100000 | 03003287 | 4b8c0000 | 00004467 | 64205818 | 67ec001c | 537056f8 |
| 0752700 | 671c5370 | 5d100000 | 02003ebf | 5fa055f0 | 671c5370 | 36a43724 | 00183678 | 001c320c | 239c0000 | 000cc5cc | 03003287 | 29c82c57 |
| 0752760 | 000db010 | 000a886c | 00076d61 | 696e2e70 | 6c000000 | 000032f7 | b328cbe8 | 000acc38 | 00000000 | 0009a920 | 02000887 | 00002c07 |
| 0753040 | 00000008 | 000b0bd8 | 000b0bd9 | 00010044 | 00000000 | 0000331f | b3280731 | 0009cd54 | 00000000 | 27f0001c | 000accfc | 5d100000 |
| 0753120 | 03003287 | 5f8c671c | 239c0000 | 000b0b9c | 2cac0007 | 0002438a | 2ca00339 | 00000000 | 00000001 | 000b0bbc | 000aaa54 | 000b0c0c |
| 0753200 | 000b0bfc | 000b0bc8 | 2aa80bea | 000b0c18 | 000aac42 | 29c8ff79 | 000b0c00 | 000acd06 | 2b240a57 | 0002438a | 000aaa5e | 00087365 |
| 0753260 | 616f702e | 706c0000 | 00000000 | 00076c65 | 782f746f | 7000b66c | 000b0d40 | 0000002c | b288b66c | 000001e0 | 7fffffff | 000c44e4 |
| 0753340 | 02000ce5 | 0100147d | 01002d65 | 0000000b | 00002aff | 002d2f68 | 6f6d652f | 6f736173 | 312f612f | 73726565 | 2f73656d | 616e7469 |
| 0753420 | 635f6368 | 65636b31 | 2f617373 | 65727469 | 6f6e7300 | 00302f68 | 6f6d652f | 6f736173 | 312f612f | 73726565 | 2f73656d | 616e7469 |
| 0753500 | 635f6368 | 65636b31 | 2f617373 | 65727469 | 6f6e732e | 706c002e | 0000002c | 000c4540 | b27cb66c | 000001e2 | 7fffffff | 000b9648 |
| 0753560 | 02000ce5 | 0200293d | 00003a2f | 00000263 | 00002aff | 0000002c | 0009f070 | b27cb66c | 000001f1 | 7fffffff | 0009cd50 | 02000ce5 |
| 0753640 | 02001f6d | 00003a2f | 00002c07 | 00002aff | 00116173 | 73657274 | 5f656163 | 685f636f | 6e737400 | 000b0e20 | 0000002c | b27cb66c |
| 0753720 | 000001e4 | 000001f0 | 0009cbc1 | 02000ce5 | 02002385 | 00003a2f | 00002c07 | 00002aff | 00000030 | 000b0d70 | b0f8b66c | 000001e5 |
| 0754000 | 7fffffff | 000c64f5 | 02000ce5 | 03003a35 | 0000000c | 00000010 | 00000014 | 00001f17 | 0000002c | 000b0da0 | b4f0b4e4 | 000001e5 |
| 0754060 | 7fffffff | 000c652d | 00000000 | 00000001 | 000f4d88 | 0002438a | 000efb18 | 0000002c | 000b0df8 | b288b66c | 000001ed | 7fffffff |
| 0754140 | 000b0df8 | 02000ce5 | 02003a75 | 0000000c | 00000003 | 00002aff | 0000002c | 000b0dcc | b288b66c | 000001ee | 7fffffff | 000c6769 |
| 0754220 | 02000ce5 | 02003a75 | 0000000c | 0000000e | 00001f17 | 000b0fac | 00000080 | 000ed7fc | 000ed840 | 000ed884 | 000ed9d9 | 00000000 |
| 0754300 | 00000000 | 000ed9c8 | 000eda74 | 000ed799 | 00000000 | 00000000 | 00000000 | 00000000 | 00000000 | 000b0fac | 00000040 | 000bdad8 |
| 0754360 | 000d0330 | 000aa95c | 00000000 | 00000000 | 000a6810 | 000bdcd0 | 000db118 | 000cf84d | 000a19b0 | 000da53c | 00000000 | 000b0b7c |
| 0754440 | 00000000 | 2c78010c | 0002438a | 45e80028 | 4728002c | 47403410 | 003043e4 | 04003cdf | 6e1c0028 | 671c6e1c | 002c6af0 | 0020442c |
| 0754520 | 0200166f | 6e580020 | 6bb443e4 | 02000cdf | 4b8c0000 | 00003cd7 | 6c34247c | 0007ecac | 0034344c | 3eec0030 | 382c002c | 3af40028 |
| 0754600 | 000c9ae0 | 002c2e7c | ae740024 | 2ba0002c | 009638fc | 002041fc | 00001aff | 3380001c | 3af40028 | 000c9aa0 | 0028aa89 | 00242e98 |
| 0754660 | 93500020 | 9afc0018 | 32d44c70 | 000021ef | 37c40020 | 31a44a7c | 00142c88 | 00422e7c | ac082ba0 | 00240022 | 382c0020 | 5d7c0000 |
| 0754740 | 01003ce7 | 6a50bfcc | a8582e98 | 32d44c70 | 000029e7 | 2c880018 | 2c5832d4 | 4e1c0000 | 00001b97 | 37c40020 | 31a44a7c | 00143774 |
| 0755020 | 56f8671c | 6d505aec | 030033cf | 6e1c001c | 6dd86d94 | 723c2c58 | 3d004a7c | 000c723c | 000b10bc | 00000038 | b27cb66c | 00000221 |
| 0755100 | 00000256 | 000b10c0 | 02000ce5 | 05001b0d | 00003cff | 00000013 | 00002c07 | 0064dd63 | 0000026b | 00002aff | 28c40058 | 000b1038 |
| 0755160 | 45b85b58 | 04003cdf | 6af0001c | 6aa0671c | 6a0056f8 | 67506a50 | 447c0000 | 04003cdf | 6e58001c | 6e086bb4 | 6d8043e4 | 01001b77 |
| 0755240 | 6b7439a4 | 0007e68c | 002043e4 | 04003cdf | 6e58001c | 6e086dc4 | 6d802340 | 000c9bac | 28c40040 | 000b1078 | 5d7c0000 | 04003cdf |
| 0755320 | 66700018 | 4b8c0000 | 00001aff | 67504408 | 04003cdf | 6c840018 | 6c344af8 | 00001aff | 6bb443e4 | 01001b77 | 6bf422bc | 0007e68c |
| 0755400 | 29540040 | 0002438a | 5d7c0000 | 04003cdf | 66700018 | 4b8c0000 | 0000349f | 67504408 | 04003cdf | 6c840018 | 6c344af8 | 0000349f |
| 0755460 | 6bb443e4 | 01001b77 | 6bf422bc | 0007e68c | 000b1314 | 00000070 | b27cb66c | 00000222 | 00000257 | 000b10f8 | 02000ce5 | 05001b0d |
| 0755540 | 00003d07 | 0000001b | 00002c07 | 0064e123 | 0000026b | 00002aff | 000b1314 | 00000038 | b27cb66c | 00000223 | 00000258 | 000b1318 |
| 0755620 | 02000ce5 | 05001b0d | 00003d17 | 0000000b | 00002c07 | 0064e7a3 | 0000026b | 00002aff | 2c7801e8 | 0002438a | 5d100000 | 05003d1f |
| 0755700 | 68546af0 | 005c671c | 6af0004c | 6af00048 | 5d100000 | 07003d27 | 6af00030 | 6af00028 | 6af00038 | 6af00020 | 6af00024 | 69b06af0 |
| 0755760 | 004038ac | 33bc3804 | 32d4247c | 000c9d24 | 00603410 | 00543804 | 32f00058 | 24d00000 | 000c9c24 | 00603894 | 005c3804 | 40b40058 |
| 0756040 | 000c9b64 | 00583380 | 0050411c | 00000054 | 000c9864 | 0054382c | 004c411c | 00000050 | 000c9588 | 005038fc | 004c3894 | 004837f0 |
| 0756120 | 3c480000 | 000c99b0 | 00483968 | 00183244 | 3228382c | 003832f0 | 003c247c | 000c8d48 | 004843e4 | 01003d3f | 6af00044 | 3c480000 |
| 0756200 | 0007e68c | 00482e7c | ac082ba0 | 0048001e | 382c0038 | 4e700000 | 000034c7 | a8582e98 | 37c40044 | 4a7c0040 | 2c88000e | 2c5837c4 |
| 0756260 | 00404c70 | 00000003 | 35400018 | 001c3244 | 3410002c | 42540000 | 000033bf | 40b4003c | 000c8d48 | 003c43e4 | 0100343f | 6af00034 |
| 0756340 | 3af4001c | 0007e68c | 003c2ba0 | 003c0012 | 37c40038 | 4e1c0000 | 0000344f | 2c88004c | 2c582e7c | ac082ba0 | 003c002e | 382c0038 |

```
0756420  4e700000 000034bf a8582e98 37c40030 4e1c0000 00003d1f 37c40028 4e1c0000 00003d1f 2c880014 2c5837c4 00344a7c
0756500  00303df4 002c4a7c 002843e4 01003d3f 6c580024 3af4001c 0007e68c 002443e4 01001f67 6e580020 40b4001c 0007e68c
0756560  001c43e4 04003d37 6dd86dc4 6d506d3c 447c0000 02000cdf 4b8c0000 00003d2f 6bb4234c 000803ec 000b1390 00000038
0756640  b27cb66c 00000224 00000259 000b1394 02000ce5 05001b04 00003d47 0000000b 00002c07 0064ec23 0000026b 00002aff
0756720  2c780044 0002438a 45b843c0 04003d37 5f6443e4 02000ce7 6b744af8 00001f17 447c0000 02000cdf 4b8c0000 00003d2f
0757000  6bb4247c 0007eb8c 00102ecc 24200000 000c9db4 000b15b4 00000038 b27cb66c 00000225 0000025a 000b15b8 02000ce5
0757060  05001b0d 00003d4f 0000000b 00002c07 0064eda3 0000026b 00002aff 2c7801ec 0002438a 25202ba0 003801d6 24d00000
0757140  000808cc 003843e4 07003d27 6a506aa0 6af0001c 6af00020 6af00024 6af00028 6af0002c 447c0000 05003d1f 6af00034
0757220  6af00030 6bb46a00 69b0247c 000c9cf4 003842ac 00003d57 00080d0c 00383c9c 00000034 00080d0c 003442ac 00003d5f
0757300  00080d0c 0034247c 0007fd0c 003442ac 00003d67 00080d0c 0034247c 0007fd0c 00342e7c ac082ba0 00340016 392c0030
0757360  57585370 5370bfcc a8582e98 2c880038 2c5842ac 00003d6f 00080d0c 0034247c 0007fd0c 00343c9c 00000030 000c9f18
0757440  003042ac 00003d7f 00080d0c 0030247c 0007fd0c 003042ac 00003d97 00080d0c 0030247c 0007fd0c 00303984 0020002c
0757520  3984001c 00283984 00180024 38fc0020 3994001c 38183a4c 000c9f38 001442ac 00003d97 00080d0c 0014247c 0007fd0c
0757600  001442ac 00003d9f 00080d0c 0014247c 0007fd0c 001439f8 000c9f58 001442ac 00003daf 00080d0c 0014247c 0007fd0c
0757660  001442ac 00003db7 00080d0c 0014247c 0007fd0c 001437f0 3b4c0000 000c9f78 001442ac 00003daf 00080d0c 0014247c
0757740  0007fd0c 001442ac 00003dc7 00080d0c 0014247c 0007fd0c 001437f0 3b4c0000 000c9f98 000c42ac 00003dd7 00080d0c
0760020  000c247c 0007fd0c 000c42ac 00002d97 00080d0c 000c247c 0007fd0c 000cc5a8 2c58234c 0008092c 000b1698 00000038
0760100  b27cb66c 00000226 0000025b 000b169c 02000ce5 05001b0d 00003d77 0000000b 00002c07 0064f8c3 0000026b 00002aff
0760160  275400ac 0002438a 56f8671c 682c5aec 030033cf 6aa06a50 6a0042ac 00003ddf 00080d0c 001c3aa0 00080d0c 001842ac
0760240  00003d5f 00080d0c 0018247c 0007fd0c 001842ac 00003de7 00080d0c 00183a4c 00080d0c 001442ac 00003def 00080d0c
0760320  0014247c 0007fd0c 001442ac 00003df7 00080d0c 001439f8 00080d0c 001042ac 00003def 00080d0c 0010247c 0007fd0c
0760400  001042ac 00003dff 00080d0c 0010247c 0007fd0c 00102340 000c9f18 000b1814 00000038 b27cb66c 00000227 0000025c
0760460  000b1818 02000ce5 05001b0d 00003d8f 0000003b 00002c07 0064f9c3 0000026b 00002aff 2c780144 0002438a 45e80024
0760540  47280020 4790001c 47e44848 0018482c 001c4810 002042ac 00003e07 00080d0c 00283c9c 00000024 00080d0c 002442ac
0760620  00003def 00080d0c 0024247c 0007fd0c 002442ac 00003e0f 00080d0c 00243c9c 00000020 00080d0c 002042ac 00003def
0760700  00080d0c 0020247c 0007fd0c 002042ac 00003e17 00080d0c 00203c9c 0000001c 00080d0c 001c42ac 00003def 00080d0c
0760760  001c247c 0007fd0c 001c42ac 00003e1f 00080d0c 001c3aa0 00080d0c 001842ac 00003def 00080d0c 0018247c 0007fd0c
0761040  001842ac 00003e27 00080d0c 00183a4c 00080d0c 001442ac 00003def 00080d0c 0014247c 0007fd0c 001442ac 00003e2f
0761120  00080d0c 001439f8 00080d0c 001042ac 00003def 00080d0c 0010247c 0007fd0c 001042ac 00003e37 00080d0c 001039a4
0761200  00080d0c 000c42ac 00003def 00080d0c 000c234c 0007fd0c 000b19c8 00000038 b27cb66c 00000228 0000025d 000b19cc
0761260  02000ce5 05001b0d 00003da7 0000000b 00002c07 0064fac3 0000026b 00002aff 2954017c 0002438a 56f8671c 682c5aec
0761340  04003c77 6af00028 6a506af0 00246aa0 43000000 00003e3f 00080d0c 002c3c9c 00000028 00080d0c 002842ac 00000877
0761420  00080d0c 002842ac 00003e47 00080d0c 0028247c 0007fd0c 002842ac 00003de7 00080d0c 00283c9c 00000024 00080d0c
0761500  002442ac 00003def 00080d0c 0024247c 0007fd0c 002442ac 00003e4f 00080d0c 00242e7c ac4c2ba0 00240058 37b056f8
0761560  6af00020 55f0671c 55f06af0 001c5370 bfcca874 2e98247c 00080d0c 002442ac 00003e57 00080d0c 00243c9c 00000020
0761640  00080d0c 002042ac 00003e57 00080d0c 00203c9c 0000001c 00080d0c 001c2c88 000e2c58 3c480000 00080d0c 001842ac
0761720  00003def 00080d0c 0018247c 0007fd0c 001842ac 00003e5f 00080d0c 00182e7c ac082ba0 00180016 380454a8 a8582e98
0762000  329c4c70 0000348f 2c88000a 2c58329c 4a7c0014 40e00000 00080d0c 001042ac 00003def 00080d0c 0010247c 0007fd0c
0762060  001042ac 00003dff 00080d0c 0010247c 0007fd0c 00102340 000c9f58 000b1c9c 00000038 b27cb66c 00000229 0000025e
0762140  000b1ca0 02000ce5 05001b04 00003dbf 00000013 00002c07 0064fbc3 0000026b 00002aff 2954029c 0002438a 56f8671c
0762220  682c5aec 06003c97 6a506af0 00386af0 00346af0 00305fa0 6aa046ec 31d40024 43000000 00003e3f 00080d0c 00403c9c
0762300  00000038 00080d0c 004042ac 00000877 00080d0c 004042ac 00003e47 00080d0c 0040247c 0007fd0c 004042ac 00003de7
0762360  00080d0c 00403c9c 00000034 00080d0c 004042ac 00003def 00080d0c 0040247c 0007fd0c 004042ac 00003e4f 00080d0c
0762440  00402e7c ac4c2ba0 0040005c 37c40030 56f86e1c 002455f0 671c55f0 6af0003c 5370bfcc a8742e98 24d00000 00080d0c
0762520  004042ac 00003e57 00080d0c 00403c9c 00000024 00080d0c 004042ac 00003e57 00080d0c 00403c9c 0000003c 00080d0c
0762600  003c2c88 000e2c58 3af40030 00080d0c 003c42ac 00003def 00080d0c 003c247c 0007fd0c 003c3410 002c37f0 447c0000
0762660  06003c97 6dc46e58 00386e58 00346e58 00305fa0 6e08247c 000ca1e8 003042ac 00003e5f 00080d0c 00302e7c ac082ba0
0762740  0030001a 382c002c 54a8a858 2e9832f0 00284c70 0000348f 2c88000c 2c5832f0 00284a7c 002c411c 00000028 00080d0c
0763020  002842ac 00003def 00080d0c 0028247c 0007fd0c 002842ac 00003e6f 00080d0c 00282e7c ae74001c 2ba00028 005a37b0
0763100  56f86e1c 002455f0 671c55f0 6af00020 5370bfcc aa88001c 2e98247c 00080d0c 002842ac 00003e57 00080d0c 0028411c
0763160  00000024 00080d0c 002442ac 00003e57 00080d0c 00243c9c 00000020 00080d0c 00202c89 00362c30 002617b0 5d100000
0763240  01003c9f 5fa0bfcc aa88001c 2e9842ac 0000348f 00080d0c 001c2c88 000e2c58 3c480000 00080d0c 001842ac 00003def
0763320  00080d0c 0018247c 0007fd0c 001842ac 00003e77 00080d0c 00183a4c 00080d0c 001442ac 00003def 00080d0c 0014247c
0763400  0007fd0c 001442ac 00003dff 00080d0c 0014247c 0007fd0c 00142330 000c9f78 000b1fd0 00000038 b27cb66c 0000022a
0763460  0000025f 000b1fd4 02000ce5 05001b0d 00003dcf 00000013 00002c07 0064fcc3 0000026b 00002aff 295402fc 0002438a
```

| | | | | | | | | | | | | |
|---|---|---|---|---|---|---|---|---|---|---|---|---|
| 0763540 | 56f8671c | 692c5aec | 06003c97 | 6af0001c | 6af0003c | 6af00038 | 6af00034 | 5fa06aa0 | 46ec31d4 | 002842ac | 00003e3f | 00080d0c |
| 0763620 | 00443c9c | 0000003c | 00080d0c | 004442ac | 00000877 | 00080d0c | 004442ac | 00003e47 | 00080d0c | 0044247c | 0007fd0c | 004442ac |
| 0763700 | 00003de7 | 00080d0c | 00443c9c | 00000038 | 00080d0c | 004442ac | 00003def | 00080d0c | 0044247c | 0007fd0c | 004442ac | 00003e4f |
| 0763760 | 00080d0c | 00442e7c | ac4c2ba0 | 0044005c | 37c40034 | 56f86e1c | 002855f0 | 671c55f0 | 6af00040 | 5370bfcc | a8742e98 | 24d00000 |
| 0764040 | 00080d0c | 004442ac | 00003e57 | 00080d0c | 00443c9c | 00000028 | 00080d0c | 004442ac | 00003e57 | 00080d0c | 00443c9c | 00000040 |
| 0764120 | 00080d0c | 00402c88 | 000e2c58 | 3af40034 | 00080d0c | 004042ac | 00003def | 00080d0c | 0040247c | 0007fd0c | 00403410 | 003037f0 |
| 0764200 | 447c0000 | 06003c97 | 6e58001c | 6e58003c | 6e580038 | 6e580034 | 5fa06e08 | 24d00000 | 000ca1e8 | 003442ac | 00003e5f | 00080d0c |
| 0764260 | 00342e7c | ac082ba0 | 0034001a | 382c0030 | 54a8a858 | 2e9832f0 | 002c4c70 | 0000348f | 2c88000c | 2c5832f0 | 002c4a7c | 0030411c |
| 0764340 | 0000002c | 00080d0c | 002c42ac | 00003def | 00080d0c | 002c247c | 0007fd0c | 002c42ac | 00003e6f | 00080d0c | 002c2e7c | ae740020 |
| 0764420 | 2ba0002c | 005a37b0 | 56f86e1c | 002855f0 | 671c55f0 | 6af00024 | 5370bfcc | aa880020 | 2e98247c | 00080d0c | 002c42ac | 00003e57 |
| 0764500 | 00080d0c | 002c411c | 00000028 | 00080d0c | 002842ac | 00003e57 | 00080d0c | 00283c9c | 00000024 | 00080d0c | 00242c88 | 00362c30 |
| 0764560 | 002637b0 | 5d100000 | 01003c9f | 5fa0bfcc | aa880020 | 2e9842ac | 0000348f | 00080d0c | 00202c88 | 000e2c58 | 3c480000 | 00080d0c |
| 0764640 | 002042ac | 00003def | 00080d0c | 0020247c | 0007fd0c | 002042ac | 00003e77 | 00080d0c | 00203c9c | 0000001c | 00080d0c | 001c42ac |
| 0764720 | 00003def | 00080d0c | 001c247c | 0007fd0c | 001c2e7c | ac4c2ba0 | 001c001c | 37b05aec | 01003c9f | 671cbfcc | a8742e98 | 31a44a7c |
| 0765000 | 00142c88 | 000c2c58 | 32b84c70 | 0000348f | 43000000 | 00003df7 | 00080d0c | 0018408c | 00080d0c | 001442ac | 00003def | 00080d0c |
| 0765060 | 0014247c | 0007fd0c | 001442ac | 00003dff | 00080d0c | 0014247c | 0007fd0c | 00142330 | 000c9f98 | 000b2068 | 00000038 | b27cb66c |
| 0765140 | 0000022b | 00000260 | 000b206c | 02000ce5 | 05001b0d | 00003e67 | 0000001b | 00002c07 | 00650f43 | 0000026b | 00002aff | 27f0002e |
| 0765220 | 000b2034 | 5d100000 | 06003c97 | 671c5fb4 | 00145758 | 67505fa0 | 547c0000 | 04003c77 | 6b74671c | 5f8c4950 | 228c2a47 | 29540030 |
| 0765300 | 0002438a | 5d100000 | 06003c97 | 67b85fb4 | 00145758 | 5fa06750 | 447c0000 | 06003c97 | 6c345fb4 | 001422bc | 000ca1e8 | 000b231c |
| 0765360 | 000000b8 | b130b66c | 0000022c | 00000261 | 000c4611 | 02000ce5 | 05001b0d | 00003cc7 | 0000001b | 00002c07 | 0064d023 | 0000026b |
| 0765440 | 00002aff | 000b231c | 00000080 | 000c9d04 | 00000000 | 00000000 | 00000000 | 00000000 | 00000000 | 000c9d94 | 000c9ef8 | 00000000 |
| 0765520 | 00000000 | 000ca244 | 00000000 | 000c9fa8 | 00000000 | 00000000 | 000ca0b4 | 00000000 | 00000000 | 000ca0c4 | 00000000 | 00000000 |
| 0765600 | 000b8ed5 | 000ca2a0 | 000c97d1 | 00000000 | 00000000 | 00000000 | 000c9af0 | 000c9b74 | 000c9bbc | 295401bc | 0002438a | 5d100000 |
| 0765660 | 03003287 | 4b8c0000 | 00003fdf | 60cc56f8 | 671c55f0 | 687c001c | 55f06a00 | 53705818 | 67b85370 | 5e540000 | 020031f7 | 66700018 |
| 0765740 | 5c9c0018 | 01003ebf | 67ec0018 | 5e540000 | 02000a3f | 6530001c | 5e540000 | 02000887 | 6e58001c | 5a180000 | 01003ff7 | 67b85ec0 |
| 0766020 | 0000001c | 02000a3f | 66c00020 | 001c5ec0 | 00000020 | 02000d0f | 66c00024 | 00205ec0 | 00000024 | 02000a67 | 66c00028 | 00245ec0 |
| 0766100 | 00000028 | 02000cdf | 6c840018 | 5a180000 | 02003ac7 | 5fa058e0 | 020034bf | 6c345370 | 5c9c0024 | 02000a3f | 66c00028 | 00245ec0 |
| 0766160 | 00000028 | 01002cef | 4b8c0000 | 0000400f | 5c9c0024 | 02000a3f | 66c00028 | 00245ec0 | 00000028 | 01002cef | 6c345ec0 | 00000024 |
| 0766240 | 02000a3f | 66c00028 | 00245ec0 | 00000028 | 01002cef | 4b8c0000 | 00004017 | 5c9c0024 | 02000a3f | 67ec0024 | 4b8c0000 | 00002527 |
| 0766320 | 5c9c0024 | 01002cef | 69b05ec0 | 00000020 | 02000cdf | 6c840018 | 5a180000 | 01001b77 | 5a180000 | 02003ac7 | 6d3c58e0 | 020034bf |
| 0766400 | 6c345370 | 5c9c001c | 02000cdf | 4b8c0000 | 00003d0f | 5a180000 | 02001b77 | 6c840018 | 5a180000 | 020034bf | 6c345370 | 36a4477c |
| 0766460 | 35400018 | 0020362c | 37dc42ac | 000034bf | 000cc5cc | 002433d8 | 3e700020 | 3af4001c | 000cedf4 | 001c39e8 | 3d6c2330 | 000cc8c0 |
| 0766540 | 00000040 | 000c8540 | b27cb66c | 000002c1 | 7fffffff | 000b239c | 02000ce5 | 020031ed | 020031e5 | 00003fe7 | 02003645 | 0000000c |
| 0766620 | 00000010 | 01003ff5 | 0000000e | 00002aff | 000b2514 | 00000038 | b27cb66c | 000002c2 | 00000330 | 000b2518 | 02000ce5 | 05001b0d |
| 0766700 | 00003fe7 | 0000001b | 00002c07 | 00676fa3 | 0000027b | 00002aff | 27f00044 | 000b23d8 | 5d100000 | 03001287 | 4b8c0000 | 00003fe7 |
| 0766760 | 64205818 | 67ec001c | 537056f8 | 671c5370 | 5d100000 | 01003ff7 | 671c36a4 | 37240018 | 3678001c | 320c22bc | 000cc5cc | 00000044 |
| 0767040 | 000b22e0 | b27cb66c | 000002c3 | 7fffffff | 000b242c | 02000ce5 | 020031ed | 020031e5 | 00003fe7 | 02003765 | 0000000c | 00000010 |
| 0767120 | 01003ff5 | 01003ce5 | 0000000e | 00002aff | 2354004c | 0002438a | 5d100000 | 03003287 | 4b8c0000 | 00003fe7 | 64205818 | 67ec001c |
| 0767200 | 537056f8 | 671c5370 | 5d100000 | 01003ff7 | 5a180000 | 01003ce7 | 671c36a4 | 37240018 | 3678001c | 320c22bc | 000cf1c8 | 000000ec |
| 0767260 | 000b239c | b27cb66c | 000002c4 | 7fffffff | 000b26ac | 02000ce5 | 020031ed | 020031e5 | 00003f4f | 02000a3d | 02000885 | 00004027 |
| 0767340 | 0000000c | 02000a3d | 02003645 | 0000226f | 00000010 | 02000a3d | 02000885 | 0000402f | 00000014 | 02000a3d | 02003645 | 000033d7 |
| 0767420 | 00000018 | 02000a3d | 02000885 | 00004037 | 0000001c | 02000885 | 00003ea7 | 00000020 | 020031f5 | 01003ebd | 00000024 | 02000a3d |
| 0767500 | 02000885 | 0000000e | 03003ebd | 00000026 | 00000028 | 0000002c | 02000a3d | 02000885 | 00000016 | 01003ebd | 0000002a | 02000a3d |
| 0767560 | 02000885 | 0000001e | 01003ebd | 0000002a | 02000885 | 00000022 | 02003ebd | 0000002e | 00000012 | 00002aff | 000b2834 | 00000038 |
| 0767640 | b27cb66c | 000002c5 | 00000331 | 000b2938 | 02000ce5 | 05001b0d | 00003f4f | 0000001b | 00002c07 | 00664e43 | 0000027b | 00002aff |
| 0767720 | 2c78015c | 0002438a | 5d100000 | 03003287 | 4b8c0000 | 00003f4f | 60cc56f8 | 671c55f0 | 687c0034 | 55f06af0 | 002855f0 | 6af00020 |
| 0770000 | 55f06aa0 | 55f069b0 | 53705818 | 67b85370 | 5e540000 | 020031f7 | 65300018 | 5e540000 | 01003ebf | 67b85ec0 | 00000018 | 02000a3f |
| 0770060 | 66c0001c | 00185ec0 | 0000001c | 02000887 | 6b7458e0 | 03003ebf | 6c346670 | 001c5ec0 | 00000018 | 02000a3f | 66c00020 | 00185ec0 |
| 0770140 | 00000020 | 02000887 | 6e580028 | 5a180000 | 01003ebf | 6c84001c | 5c9c0018 | 02000a3f | 66c00020 | 00185ec0 | 00000020 | 02000887 |
| 0770220 | 6e0858e0 | 01003ebf | 6c84001c | 5c9c0018 | 02000887 | 6d3c58e0 | 02003ebf | 6c346af0 | 00304768 | 34100038 | 24d00000 | 000cf228 |
| 0770300 | 003c3540 | 0018002c | 3f680038 | 38940034 | 382c0030 | 43000000 | 0000226f | 000cc5cc | 00303410 | 00243e70 | 002c3c9c | 00000028 |
| 0770360 | 000cf248 | 00283540 | 0018001c | 3f680024 | 38940020 | 320c42ac | 000033d7 | 000cc5cc | 002033bc | 3e70001c | 3c480000 | 000cf268 |
| 0770440 | 0018386c | 34302340 | 000cc60c | 0000018c | 000b242c | b27cb66c | 000002c6 | 7fffffff | 000b2af0 | 02000ce5 | 020031ed | 020031e5 |
| 0770520 | 00004027 | 02000a3d | 02003645 | 0000344f | 0000000c | 02000a3d | 02000885 | 0000403f | 00000010 | 02000a3d | 010036d5 | 00000014 |
| 0770600 | 02000a3d | 02000885 | 00003fef | 00000018 | 02000a3d | 010036dd | 0000001c | 02000a3d | 02003645 | 000034ef | 00000020 | 02000895 |

| | | | | | | | | | | | | |
|---|---|---|---|---|---|---|---|---|---|---|---|---|
| 0770660 | 00003c5f | 00000024 | 020031f5 | 03003ebd | 00000028 | 0000002c | 00000030 | 02000a3d | 02000885 | 00000012 | 02003ff5 | 0000002e |
| 0770740 | 00000032 | 02000a3d | 02000885 | 0000001a | 02003ff5 | 0000002e | 00000034 | 02000a3d | 02000885 | 00000026 | 02004005 | 0000002a |
| 0771020 | 00000038 | 02000d0d | 02000a65 | 03003b05 | 0000002a | 00000032 | 00000036 | 02000a3d | 01002ced | 0000400f | 02000a3d | 01002ced |
| 0771100 | 00000032 | 02000a3d | 01002ced | 00004017 | 02000a3d | 01002ced | 0000000e | 02000a3d | 01002ced | 0000401f | 00002527 | 02000a3d |
| 0771160 | 02000cdd | 0000002e | 01001b75 | 02003ac5 | 00000016 | 02004045 | 00000036 | 0000003a | 02000cdd | 0000002a | 01001b75 | 02003ac5 |
| 0771240 | 0000000e | 0300344d | 00000032 | 00000036 | 0000003a | 00002aff | 000b2dbc | 00000038 | b27cb66c | 000002c7 | 00000332 | 000c2df4 |
| 0771320 | 02000ce5 | 05001b0d | 00004027 | 0000001b | 00002c07 | 00679143 | 0000027b | 00002aff | 27f00280 | 000c24b4 | 5d100000 | 03003287 |
| 0771400 | 4b8c0000 | 00004027 | 64205818 | 67ec001c | 55f0687c | 003c55f0 | 6af00034 | 55f06af0 | 002855f0 | 6af00020 | 55f06aa0 | 55f069b0 |
| 0771460 | 537056f8 | 671c5370 | 5d100000 | 020031f7 | 64205c30 | 03003ebf | 67ec0024 | 66c0002c | 00205aec | 02000a3f | 64205c30 | 02000887 |
| 0771540 | 6e58003c | 5a180000 | 02003ff7 | 6c84002c | 6c840020 | 5d100000 | 02000a3f | 64205c30 | 02000887 | 6e580028 | 5a180000 | 02003ff7 |
| 0771620 | 6c84002c | 67ec0018 | 5d100000 | 02000a3f | 64205c30 | 02000887 | 6d3c58e0 | 02004007 | 6c840024 | 67b85aec | 02000d0f | 61100028 |
| 0771700 | 5d100000 | 02000a67 | 65800030 | 5c9c0030 | 03003b07 | 6c840024 | 6c840020 | 6c840018 | 5d100000 | 02000a3f | 65800030 | 5c9c0030 |
| 0771760 | 01002cef | 4b8c0000 | 0000400f | 5d100000 | 02000a3f | 65800030 | 5c9c0030 | 01002cef | 6c840020 | 5d100000 | 02000a3f | 65800030 |
| 0772040 | 5c9c0030 | 01002cef | 4b8c0000 | 00004017 | 5d100000 | 02000a3f | 61100030 | 5d100000 | 01002cef | 671c5ec0 | 00000030 | 02000a3f |
| 0772120 | 67ec0030 | 4b8c0000 | 00002527 | 5c9c0030 | 01002cef | 4b8c0000 | 0000401f | 5c9c0028 | 02000a3f | 66c00030 | 00285ec0 | 00000030 |
| 0772200 | 02000cdf | 6c84002c | 5a180000 | 01001b77 | 5a180000 | 02003ac7 | 6af00030 | 5a180000 | 02004047 | 6c840018 | 6c345ec0 | 00000028 |
| 0772260 | 02000cdf | 6c840024 | 5a180000 | 01001b77 | 5a180000 | 02003ac7 | 6b7458e0 | 0300344f | 6c840020 | 6c840018 | 6c3436a4 | 47683540 |
| 0772340 | 00180040 | 3678001c | 35c842ac | 0000344f | 000cc5cc | 00443410 | 00383e70 | 00403c9c | 0000003c | 000cf2cc | 003c34a0 | 002c3eec |
| 0772420 | 0038382c | 00343c9c | 00000030 | 000cf098 | 00303410 | 00243e70 | 002c3c9c | 00000028 | 000cf0b8 | 002834a0 | 001c3eec | 0024382c |
| 0772500 | 002031f0 | 24d00000 | 000cf0d8 | 002034e0 | 00183f68 | 001c3880 | 320c42ac | 000034ef | 000cc5cc | 0018386c | 3d302340 | 000cf0f8 |
| 0772560 | 00000150 | 000b26ac | b27cb66c | 000002c8 | 7fffffff | 000c26b0 | 02000ce5 | 020031ed | 020031e5 | 00004027 | 02000a3d | 02003645 |
| 0772640 | 0000344f | 0000000c | 02000a3d | 02000885 | 0000403f | 00000010 | 02000a3d | 02003645 | 000034ef | 00000014 | 02000885 | 00003c5f |
| 0772720 | 00000018 | 020031f5 | 03003ebd | 0000001c | 00000020 | 00000024 | 02000a3d | 02000885 | 00000012 | 02003ff5 | 00000022 | 00000026 |
| 0773000 | 02000a3d | 02000885 | 0000001a | 02004005 | 0000001e | 00000028 | 02000d0d | 02000a65 | 02000cdd | 0000001e | 02003ac5 | 0000002c |
| 0773060 | 0300344d | 00000026 | 00000007 | 00000030 | 02000a3d | 01002ced | 0000400f | 02000a3d | 01002ced | 00000026 | 02000a3d | 01002ced |
| 0773140 | 00004017 | 02000a3d | 01002ced | 0000000e | 00002527 | 02000a3d | 02000cdd | 00000022 | 01001b75 | 02003ac5 | 00000016 | 02004045 |
| 0773220 | 00000007 | 0000002a | 02000cdd | 0000001e | 01001b75 | 02003ac5 | 0000000e | 0300344d | 00000026 | 00000007 | 0000002a | 00002aff |
| 0773300 | 03003287 | 29c8003b | 000cf310 | 000b2878 | 00087265 | 73657276 | 6564006c | 00086269 | 67737461 | 7274002d | 00066572 | 726f7273 |
| 0773360 | 00000007 | 00036e6f | 72000000 | 00037265 | 6d000000 | 28c40024 | 000b2ca8 | 36903574 | 56f86c08 | 6bc84538 | 6c085370 | 56f84af8 |
| 0773440 | 000002eb | 53707220 | 000a12a8 | 00000000 | 28c40024 | 0009d138 | 36903574 | 56f86c08 | 6bc84538 | 6c085370 | 56f84af8 | 000002e3 |
| 0773520 | 53707220 | 000a689c | 00000000 | 002a2f68 | 6f6d652f | 6f736173 | 312f612f | 73726565 | 2f73656d | 616e7469 | 635f6368 | 65636b31 |
| 0773600 | 2f6c6578 | 2f6c6578 | 00642c6d | 002d2f68 | 6f6d652f | 6f736173 | 312f612f | 73726565 | 2f73656d | 616e7469 | 635f6368 | 65636b31 |
| 0773660 | 2f6c6578 | 2f6c6578 | 2e706c00 | 0000002c | 0009cc6c | b27cb66c | 000000b6 | 7fffffff | 0009ce28 | 02000ce5 | 0200293d | 00003587 |
| 0773740 | 0000023b | 00002aff | 28c40024 | 000b2c7c | 36903574 | 56f86c08 | 6bc84538 | 6c085370 | 56f84af8 | 000002db | 53707220 | 000b8f94 |
| 0774020 | 00094674 | 0000002c | 0009d684 | b27cb66c | 000000f5 | 7fffffff | 0009ce80 | 02000ce5 | 02001f6d | 00003587 | 00002c07 | 00002aff |
| 0774100 | 000b2ec8 | 000000dc | 0009d8c8 | 7fffffff | 00000000 | 000b2ddc | 0000000c | 000b2dd8 | 000b2de8 | 0000000c | 000b2de4 | 000b2df4 |
| 0774160 | 0000000c | 0009d67c | 000b2dfc | 00000008 | 000b2e34 | 00000038 | b27cb66c | 000000b9 | 000000f6 | 000b2e64 | 02000ce5 | 05001b0d |
| 0774240 | 0000358f | 0000001b | 00002c07 | 005a7143 | 0000023b | 00002aff | 000b2e60 | 0000002c | b4f0b4e4 | 000000b8 | 7fffffff | 0007eaad |
| 0774320 | 00000000 | 00000000 | 0009d538 | 0002438a | 000b9584 | 000b2ec8 | 00000038 | b27cb66c | 000000ba | 000000f7 | 000b2ecc | 02000ce5 |
| 0774400 | 05001b0d | 00003597 | 0000001b | 00002c07 | 005bb323 | 0000023b | 00002aff | 2c780030 | 0002438a | 25204754 | 34303640 | 42540000 |
| 0774460 | 0000000b | 24100000 | 000b7694 | 00142ecc | 37f03cf4 | 242c0000 | 000b76b4 | 000b2f2c | 00000038 | b27cb66c | 000000bb | 000000f8 |
| 0774540 | 000b2f30 | 02000ce5 | 05001b0d | 0000359f | 00000023 | 00002c07 | 005bb4a3 | 0000023b | 00002aff | 27f0002c | 000b782c | 56f8671c |
| 0774620 | 682c46ec | 47e43468 | 37f0247c | 000b77f8 | 001c2ecc | 38e83d6c | 24100000 | 000b7694 | 000b2f9c | 00000039 | b27cb66c | 000000bc |
| 0774700 | 000000f9 | 000b2fa0 | 02000ce5 | 05001b0d | 000035b7 | 00000023 | 00002c07 | 005bbc03 | 0000023b | 00002aff | 2c780038 | 0002438a |
| 0774760 | 45b846ec | 358847e4 | 56f84af8 | 0000016b | 55f04af8 | 0000016b | 671c3050 | 3348247c | 000b7874 | 001c38e8 | 346c2330 | 000b7894 |
| 0775040 | 000b3040 | 00000070 | b27cb66c | 000000bd | 000000fa | 000b2fd8 | 02000ce5 | 05001b0d | 000035cf | 00000013 | 00002c07 | 005bc3a3 |
| 0775120 | 0000023b | 00002aff | 000b3040 | 00000038 | b27cb66c | 000000be | 000000fb | 000b3044 | 02000ce5 | 05001b0d | 000035c7 | 00000023 |
| 0775200 | 00002c07 | 005bbfc3 | 0000023b | 00002aff | 29540034 | 0002438a | 252046d8 | 358856f8 | 671c6c08 | bfcca859 | aab4ffff | a260247c |
| 0775260 | 000b7a34 | 001039a4 | 00080d0c | 000c234c | 0007ea2c | 000b30b0 | 00000038 | b27cb66c | 000000bf | 000000fc | 000b30b4 | 02000ce5 |
| 0775340 | 05001b0d | 00002ce7 | 0000001b | 00002c07 | 005bcdc3 | 0000023b | 00002aff | 2c780038 | 0002438a | 56f8687c | 001c69b0 | 476833bc |
| 0775420 | 32d4247c | 000b7a7c | 00202ecc | 382c001c | 41080000 | 000b7a9c | 0018386c | 3d302340 | 000b7abc | 000b3160 | 000000a8 | b27cb66c |
| 0775500 | 000000c0 | 000000fd | 000b30ec | 02000ce5 | 05001b0d | 00003607 | 0000001b | 00002c07 | 005bd3e3 | 0000023b | 00002aff | 000b3120 |
| 0775560 | 00000038 | b27cb66c | 000000c1 | 000000fe | 000b3164 | 02000ce5 | 05001b0d | 00001e37 | 0000001b | 00002c07 | 005bdac3 | 0000023b |
| 0775640 | 00002aff | 000b3160 | 00000038 | b27cb66c | 000000cb | 00000108 | 000b34a0 | 02000ce5 | 05001b0d | 0000366f | 00000013 | 00002c07 |
| 0775720 | 005bfc03 | 0000023b | 00002aff | 00056172 | 726f7700 | 000b32cc | 000000a8 | b27cb66c | 000000c2 | 000000ff | 000b319c | 02000ce5 |

| | | | | | | | | | | | | |
|---|---|---|---|---|---|---|---|---|---|---|---|---|
| 0776000 | 05001b0d | 0000362f | 0000001b | 00002c07 | 005bdd63 | 0000023b | 00002aff | 000b31d0 | 00000038 | b27cb66c | 000000c3 | 00000100 |
| 0776060 | 000b31d4 | 02000ce5 | 05001b0d | 0000362f | 00000013 | 00002c07 | 005be023 | 0000023b | 00002aff | 000b32cc | 00000038 | b27cb66c |
| 0776140 | 000000c4 | 00000101 | 000b32d0 | 02000ce5 | 05001b0d | 00003617 | 0000001b | 00002c07 | 005bd5e3 | 0000023b | 00002aff | 27f0004c |
| 0776220 | 000b3250 | 56f8671c | 55f0687c | 001c69b0 | 47683410 | 0020247c | 000b7bac | 002433bc | 3e700020 | 32d4247c | 000b7a7c | 00202ecc |
| 0776300 | 382c001c | 41080000 | 000b7a9c | 0018386c | 31302340 | 000b7abc | 28c40038 | 000b3288 | 56f8687c | 001c69b0 | 476833bc | 32d4247c |
| 0776360 | 000b7a7c | 00202ecc | 382c001c | 41080000 | 000b7a9c | 0018386c | 3d302340 | 000b7abc | 28c40040 | 000b7cb8 | 56f8671c | 55f06868 |
| 0776440 | 69b04768 | 3410001c | 24d00000 | 000b7bac | 002033bc | 3e70001c | 3c480000 | 000b7b58 | 00182ecc | 386c3d30 | 24200000 | 000b7abc |
| 0776520 | 000b349c | 00000188 | b27cb66c | 000000c5 | 00000102 | 000b3308 | 02000ce5 | 05001b0d | 000035ef | 0000001b | 00002c07 | 005bcec3 |
| 0776600 | 0000023b | 00002aff | 000b333c | 00000038 | b27cb66c | 000000c6 | 00000103 | 000b3340 | 02000ce5 | 05001b0d | 0000363f | 0000001b |
| 0776660 | 00002c07 | 005beaa3 | 0000023b | 00002aff | 000b3374 | 00000038 | b27cb66c | 000000c7 | 00000104 | 000b3378 | 02000ce5 | 05001b0d |
| 0776740 | 000035af | 00000013 | 00002c07 | 005bb963 | 0000023b | 00002aff | 000b33ac | 00000039 | b27cb66c | 000000c8 | 00000105 | 000b33b0 |
| 0777020 | 02000ce5 | 05001b0d | 0000364f | 00000013 | 00002c07 | 005bf0a3 | 0000023b | 00002aff | 000b33e4 | 00000038 | b27cb66c | 000000c9 |
| 0777100 | 00000106 | 000b33e8 | 02000ce5 | 05001b0d | 00003657 | 00000013 | 00002c07 | 005bf1a3 | 0000023b | 00002aff | 000b341c | 00000038 |
| 0777160 | b27cb66c | 000000ca | 00000107 | 000b3124 | 02000ce5 | 05001b0d | 0000365f | 00000013 | 00002c07 | 005bf4a3 | 0000023b | 00002aff |
| 0777240 | 000b349c | 00000038 | b27cb66c | 000000dc | 00000119 | 000b4284 | 02000ce5 | 05001b0d | 0000379f | 00000033 | 00002c07 | 005c4ee3 |
| 0777320 | 0000023b | 00002aff | 28c40024 | 000b3474 | 35903574 | 56f86c08 | 6bc84538 | 6c085370 | 56f84af8 | 00000203 | 53707220 | 28c40024 |
| 0777400 | 000b2d60 | 36903574 | 56f86c08 | 6bc84538 | 6c085370 | 56f84af8 | 000001fb | 53707220 | 000b3908 | 00000118 | b27cb66c | 000000cc |
| 0777460 | 00000109 | 000b34d8 | 02000ce5 | 05001b0d | 00003667 | 00000013 | 00002c07 | 005bf6c3 | 0000023b | 00002aff | 000b350c | 00000038 |
| 0777540 | b27cb66c | 000000cd | 0000010a | 000b3510 | 02000ce5 | 05001b0d | 000035bf | 00000023 | 00002c07 | 005bbec3 | 0000023b | 00002aff |
| 0777620 | 000b3544 | 00000038 | b27cb66c | 000000ce | 0000010b | 000b3548 | 02000ce5 | 05001b0d | 00003677 | 00000023 | 00002c07 | 005c02c3 |
| 0777700 | 0000023b | 00002aff | 000b357c | 00000038 | b27cb66c | 000000cf | 0000010c | 000b3580 | 02000ce5 | 05001b0d | 000035d7 | 00000023 |
| 0777760 | 00002c07 | 005bc4a3 | 0000023b | 00002aff | 000b3908 | 00000038 | b27cb66c | 000000d0 | 0000010d | 000b390c | 02000ce5 | 05001b0d |
| 1000040 | 000035f7 | 00000023 | 00002c07 | 005bd0a3 | 0000023b | 00002aff | 27f0002c | 000b35dc | 5d100000 | 0100367f | 671c48f8 | 358856f8 |
| 1000120 | 4b8c0000 | 000001eb | 55f04af8 | 000001f3 | 6c087220 | 28c4003c | 000b3618 | 5d100000 | 03003367 | 4b8c0000 | 00003687 | 4b8c0000 |
| 1000200 | 00000963 | 671c48f8 | 358856f8 | 4b8c0000 | 00000153 | 55f04af8 | 00000153 | 6c087220 | 28c4002c | 000b3644 | 5d100000 | 0100368f |
| 1000260 | 671c48f8 | 358856f8 | 4b8c0000 | 000001d3 | 55f04af8 | 000001eb | 6c087220 | 28c4003c | 000b3680 | 5d100000 | 03003697 | 4b8c0000 |
| 1000340 | 0000369f | 4b8c0000 | 000015e3 | 671c48f8 | 358856f8 | 4b8c0000 | 0000017b | 55f04af8 | 000001eb | 6c087220 | 28c4003c | 000b36bc |
| 1000420 | 5d100000 | 03003697 | 4b8c0000 | 000036a7 | 4b8c0000 | 000015e3 | 671c48f8 | 358856f8 | 4b8c0000 | 000001f3 | 55f04af8 | 000001eb |
| 1000500 | 6c087220 | 28c4003c | 000b36f8 | 5d100000 | 03003697 | 4b8c0000 | 000036af | 4b8c0000 | 000015e3 | 671c48f8 | 358856f8 | 4b8c0000 |
| 1000560 | 000001e3 | 55f04af8 | 000001eb | 6c087220 | 28c4002c | 000b3724 | 5d100000 | 010036b7 | 671c48f8 | 358856f8 | 4b8c0000 | 000001e3 |
| 1000640 | 55f04af8 | 000001f3 | 6c087220 | 28c40034 | 000b81b4 | 5d100000 | 030036bf | 4b8c0000 | 000036c7 | 4b8c0000 | 000012c3 | 671c48f8 |
| 1000720 | 358856f8 | 4b8c0000 | 00000133 | 6c087220 | 000b82c1 | 000b3624 | 000b8321 | 000b8340 | 00000000 | 00000000 | 000b3704 | 000b83c9 |
| 1001000 | 00000000 | 000b81c0 | 000b81f8 | 000b8238 | 000b35e8 | 00000000 | 000b8278 | 000b35bc | 28c40034 | 000b37cc | 5d100000 | 03003387 |
| 1001060 | 4b8c0000 | 000036e7 | 4b8c0000 | 00000c83 | 671c48f8 | 358856f8 | 4b8c0000 | 00000153 | 6c087220 | 28c40034 | 000b826c | 5d100000 |
| 1001140 | 030036bf | 4b8c0000 | 000036ef | 4b8c0000 | 000012c3 | 671c48f8 | 358856f8 | 4b8c0000 | 0000015b | 6c087220 | 28c40034 | 000b829c |
| 1001220 | 5d100000 | 030036bf | 4b8c0000 | 000036ff | 4b8c0000 | 000012c3 | 671c48f8 | 358856f8 | 4b8c0000 | 0000016b | 6c087220 | 28c40034 |
| 1001300 | 000b82f4 | 5d100000 | 03003387 | 4b8c0000 | 0000370f | 4b8c0000 | 00000c83 | 671c48f8 | 358856f8 | 4b8c0000 | 0000017b | 6c087220 |
| 1001360 | 28c40034 | 000b389c | 5d100000 | 03003697 | 4b8c0000 | 00003727 | 4b8c0000 | 000015e3 | 671c48f8 | 358856f8 | 4b8c0000 | 000001e3 |
| 1001440 | 6c087220 | 28c40034 | 000b38d0 | 5d100000 | 03003697 | 4b8c0000 | 0000372f | 4b8c0000 | 000015e3 | 671c48f8 | 358856f8 | 4b8c0000 |
| 1001520 | 000001eb | 6c087220 | 28c40034 | 000b839c | 5d100000 | 03003697 | 4b8c0000 | 00003737 | 4b8c0000 | 000015e3 | 671c48f8 | 358856f8 |
| 1001600 | 4b8c0000 | 000001f3 | 6c087220 | 000b3abc | 00000070 | b27cb66c | 000000d1 | 0000010e | 000b3944 | 02000ce5 | 05001b0d | 000035e7 |
| 1001660 | 00000023 | 00002c07 | 005bcb23 | 0000023b | 00002aff | 000b3abc | 00000038 | b27cb66c | 000000d2 | 0000010f | 000b3ac0 | 02000ce5 |
| 1001740 | 05001b0d | 0000374f | 00000023 | 00002c07 | 005c21e3 | 0000023b | 00002aff | 27f00068 | 000b39dc | 5d100000 | 0600374f | 671c687c |
| 1002020 | 001c6af0 | 002069b0 | 6a006af0 | 00244a94 | 002435ec | 47e43410 | 0028247c | 000b853c | 002c3df4 | 002856f8 | 4b8c0000 | 00000173 |
| 1002100 | 67b83500 | 00183894 | 0024382c | 00203c9c | 0000001c | 000b855c | 001c38e8 | 3d6c2330 | 000b857c | 28c40044 | 000b3a20 | 5d100000 |
| 1002160 | 0600374f | 671c4af8 | 00000003 | 4b8c0000 | 00000003 | 682c6a00 | 67ec0018 | 49380018 | 35ec47e4 | 33d8247c | 000b853c | 001c38e8 |
| 1002240 | 3d6c2330 | 000b857c | 28c40054 | 000b3a74 | 5d100000 | 0600374f | 671c682c | 6a004af8 | 00000003 | 4b8c0000 | 00000003 | 6a504a94 |
| 1002320 | 001435ec | 47e43410 | 001c247c | 000b853c | 00203df4 | 001c56f8 | 4b8c0000 | 00000173 | 67b83968 | 0018231c | 000b855c | 29540044 |
| 1002400 | 0002438a | 5d100000 | 0600374f | 671c4af8 | 00000003 | 4b8c0000 | 00000003 | 4b8c0000 | 00000003 | 4b8c0000 | 00000003 | 67ec0018 |
| 1002460 | 49380018 | 35ec3664 | 239c0000 | 000b853c | 000b3ba0 | 000000a8 | b27cb66c | 000000d3 | 00000110 | 000b3af8 | 02000ce5 | 05001b0d |
| 1002540 | 000021e7 | 0000001b | 00002c07 | 005c29e3 | 0000023b | 00002aff | 000b3b2c | 00000038 | b27cb66c | 000000d4 | 00000111 | 000b3b30 |
| 1002620 | 02000ce5 | 05001b0d | 000021ef | 0000001b | 00002c07 | 005c3163 | 0000023b | 00002aff | 000b3ba0 | 00000038 | b27cb66c | 000000d5 |
| 1002700 | 00000112 | 000b3ba4 | 02000ce5 | 05001b0d | 00003777 | 0000001b | 00002c07 | 005c3503 | 0000023b | 00002aff | 28c4003c | 000b8760 |
| 1002760 | 56f86868 | 69b03574 | 47683380 | 001c247c | 000b7c04 | 00202ecc | 33bc3e70 | 001c3aa0 | 000b7b58 | 00182ecc | 386c3d30 | 24200000 |
| 1003040 | 000b86a0 | 000b3c28 | 00000038 | b27cb66c | 000000d6 | 00000113 | 000b3c2c | 02000ce5 | 05001b0d | 00001fbf | 0000002b | 00002c07 |

```
1003120 005c2ae3 0000023b 00002aff 2c780050 0002438a 45c446d8 35ec3664 36dc0018 32b8247c 000b87c0 00183d3c 3ba00000
1003200 0007fccc 001039a4 000b87e0 000c43e4 01003787 5fa043c0 02000cdf 4b8c0000 00002c07 6bb4234c 000803ec 000b3cc8
1003260 00000038 b27cb66c 000000d7 00000114 000b3ccc 02000ce5 05001b0d 0000377f 00000023 00002c07 005c3e03 0000023b
1003340 00002aff 27f00034 000b3c90 56f8671c 682c35ec 47d033bc 24d00000 000b7b58 00182ecc 38d43d60 42540000 0000000b
1003420 24200000 000b8810 29540034 0002438a 56f8671c 5fa02520 46d835ec 3664247c 000b7a7c 0010247c 000b8860 001039a4
1003500 00080d0c 000c234c 0007ea2c 000b3dc0 00000038 b27cb66c 000000d8 00000115 000b3dc4 02000ce5 05001b0d 00003777
1003560 00000023 00002c07 005c4083 0000023b 00002aff 27f00034 000b3d30 56f8671c 682c4714 35ec47d0 33bc247c 000b7b58
1003640 001caa6c aaf00001 ac4c2ecc 38d43d60 24200000 000b8810 28c4004c 000b3d7c 56f8687c 001c69b0 47143588 47d03380
1003720 0020247c 000b7c04 00242ecc 33bc3e70 00203c9c 0000001c 000b7b58 001caa6c aaf00001 ac4c2ecc 38d43d60 24200000
1004000 000b8810 2954003e 0002438a 4e1c0000 00000007 25204754 47a84408 01003787 6b8843c0 02000cdf 4b8c0000 00002c07
1004060 6bf4247c 0007eb8c 00143788 4a7c000c 723c3da2 000b3e58 00000038 b27cb66c 000000d9 00000116 000b3e5c 02000ce5
1004140 05001b0d 0000376f 00000023 00002c07 005c2be3 0000023b 00002aff 28c40030 000b3e24 4e1c0000 000036ef 357435ec
1004220 57584af8 0000022b 55f04af8 0000015b 67503050 366422bc 000b853c 29540030 0002438a 4e1c0000 000036ff 357435ec
1004300 57584af8 0000022b 55f04af8 0000016b 67503050 366422bc 000b853c 000b40e8 00000038 b27cb66c 000000da 00000117
1004360 000b40ec 02000ce5 05001b0d 00003747 00000023 00002c07 005c0c63 0000023b 00002aff 27f000a8 000b3f34 5d100000
1004440 07003747 687c001c 6af0002c 6af00024 6af00020 69b06a00 6af00030 4a940030 35ec47d0 34100034 3af4001c 000b89bc
1004520 00383df4 003456f8 4b8c0000 0000011b 67ec0018 3540001c 002838fc 00303228 382c002c 3af4001c 000b89dc 002c3df4
1004600 002856f8 4b8c0000 00000173 67b83520 00183894 0024382c 00203c9c 0000001c 000b89fc 001c3d18 56f84af8 0000011b
1004660 67843844 24100000 000b857c 28c400a4 000b3fd8 5d100000 07003747 68546af0 00246af0 001c6aa0 4b8c0000 00000003
1004740 4b8c0000 00000003 6af00028 4a940028 35ec47a8 3410002c 3bf40000 000b89bc 00303df4 002c56f8 4b8c0000 0000011b
1005020 67ec0018 3540001c 002038fc 00283228 382c0024 3bf40000 000b89dc 00243df4 002056f8 4b8c0000 00000173 67b834e0
1005100 00183894 001c3818 3bf40000 000b89fc 00143d00 56f84af8 0000011b 6d0c723c 28c40088 000b4060 5d100000 07003747
1005160 687c001c 6af00020 4b8c0000 00000003 4b8c0000 00000003 69b06a00 6af00024 4a940024 35ec47d0 34100028 3af4001c
1005240 000b89bc 002c3df4 002856f8 4b8c0000 0000011b 67ec0018 3520001c 38fc0024 3228382c 00203c9c 0000001c 000b89dc
1005320 001c3d18 56f84af8 0000011b 678438d4 24100000 000b857c 29540084 0002438a 5d100000 07003747 68546aa0 4b8c0000
1005400 00000003 4b8c0000 00000003 4b8c0000 00000003 4b8c0000 00000003 6af0001c 4a94001c 35ec47a8 34100020 3bf40000
1005460 000b89bc 00243df4 002056f8 4b8c0000 0000011b 67ec0018 34e0001c 38fc001c 32283818 3bf40000 000b89dc 00143d00
1005540 56f84af8 0000011b 6d0c723c 000b4280 00000138 b27cb66c 000000db 00000118 000b3420 02000ce5 05001b0d 00003797
1005620 0000001b 00002c07 005c4de3 0000023b 00002aff 000b4160 00000040 00000000 00000000 0009cf08 00000000 00000000
1005700 000b9348 000b4bfc 0009d2e8 00000000 000b9585 000b7fdc 00000000 00000000 00000000 000b4280 000000c0 00000000
1005760 00000000 00000000 00000000 00000000 00000000 00000000 00000000 00000000 00000000 00000000 00000000 00000000
1006040 00000000 00000000 00000000 00000000 00000000 00000000 00000000 00000000 00000000 000b899c 000b850c 000b8d54
1006120 000b8da8 000b8f94 000b8814 000b86d8 000b87f0 00000000 00000000 000b8a64 000b8a90 0009cf41 00000000 000b8afc
1006200 000b8b79 000b8c1c 0009d2e8 00000000 000b9585 000b85e4 000b8ced 00000000 00000000 2c780060 0002438a 45d046d8
1006260 475447e4 48800018 001c4880 001c0020 aa50aab4 0010a4bc 001e3a4c 000b8ab0 00243aa0 00080d0c 0024247c 0007ea2c
1006340 00242c88 00023984 00180020 38fc001c 388037f0 3bf40000 000b8ad0 00142330 0007fccc 000b42f0 00000038 b27cb66c
1006420 000000dd 0000011a 000b42f4 02000ce5 05001b0d 000037b7 0000002b 00002c07 005c5683 0000023b 00002aff 2c780038
1006500 0002438a 45b85758 67506a00 47684880 0018001c 35200018 396c39a4 000b8b1c 00202ecc 39840018 001c3da8 23fc0000
1006560 000b8b3c 000b43c0 00000038 b27cb66c 000000de 0000011b 000b43c4 02000ce5 05001b0d 000037bf 0000002b 00002c07
1006640 005c58e3 0000023b 00002aff 27f00048 000b436c 45d046ec 47403600 36780018 3ba00000 000b7b58 00182ba0 0018000e
1006720 37f0379c 242c0000 000b8b90 2c5839f8 000b8bb0 001039a4 00080d0c 000c234c 0007ea2c 29540050 0002438a 45dc4700
1007000 47403600 36780018 329c247c 000b7a7c 001c2ba0 001c0016 37f03aa0 000b8bec 00183804 3d00234c 000b7a9c 2c584078
1007060 000b8c0c 001039a4 0008040c 000c234c 0007ea2c 000b4494 00000038 b27cb66c 000000df 0000011c 000b4488 02000ce5
1007140 05001b04 000037c7 0000002b 00002c07 005c59e3 0000023b 00002aff 27f00038 000b442c 45b85758 67506a00 47684880
1007220 0018001c 35200018 396c39a4 000b8b1c 00202ecc 39840018 001c3da8 23fc0000 000b8b3c 28c40054 000b8c3c 45b85758
1007300 6af00020 6a004768 359c4880 0018001c 33800024 24d00000 000b7c04 00282ecc 35200018 3f680024 386c382c 002039a4
1007360 000b8b1c 00202ecc 39840018 001c3da8 23fc0000 000b8b3c 000b450c 00000038 b27cb66c 000000e0 0000011d 000b4510
1007440 02000ce5 05001b0d 000037a7 0000002b 00002c07 005c4fe3 0000023b 00002aff 2c780050 0002438a 252046d8 47543668
1007520 36dc0018 3348247c 000b8c8c 00183d3c 3ba00000 0007fccc 001039a4 000b8cac 000c43e4 010017f7 5fa043c0 02000cdf
1007600 4b8c0000 00002c07 6bb4234c 000803ec 000b4578 00000038 b27cb66c 000000e1 0000011e 000b457c 02000ce5 05001b0d
1007660 000037ef 00000023 00002c07 005c6463 0000023b 00002aff 2c780034 0002438a 45b85758 67506a00 47e43468 3b4c0000
1007740 000b8d04 001c2ecc 39680018 3d9c41fc 0000000b 24100000 000b8d24 000b4684 00000038 b27cb66c 000000e2 0000011f
1010020 000b4688 02000ce5 05001b04 00003807 0000002b 00002c07 005c6923 0000023b 00002aff 27f00040 000b45ec 45b85758
1010100 67506a00 4790001c 36644864 00183468 3b4c0000 000b8d04 0020aa88 001caaf0 0001ac90 2ecc3968 00183d9c 24100000
1010160 000b8d24 28c40059 000b4644 45b85758 6af00020 6a004790 001c359c 48640018 33800024 24d00000 000b7c04 00282ecc
```

| | | | | | | | | | | | | |
|---|---|---|---|---|---|---|---|---|---|---|---|---|
| 1010240 | 34683eec | 0024382c | 002039a4 | 000b8d04 | 00202ecc | aa88001c | aaf00001 | ac903968 | 00183d9c | 24100000 | 000b8d24 | 2954003a |
| 1010320 | 0002438a | 54a82520 | 47bc4810 | 001843e4 | 010037f7 | 6bc843c0 | 02000cdf | 4b8c0000 | 00002c07 | 6bb4247c | 0007eb8c | 00143788 |
| 1010400 | 4a7c000c | 723c4672 | 000b470c | 00000038 | b27cb66c | 000000e3 | 00000120 | 000b4710 | 02000ce5 | 05001b0d | 00003757 | 00000023 |
| 1010460 | 00002c07 | 005c23c3 | 0000023b | 00002aff | 2c780050 | 0002438a | 5d100000 | 02003757 | 682c671c | 48f83588 | 47d056f8 | 4b8c0000 |
| 1010540 | 0000013b | 67503050 | 33f4323c | 24d00000 | 000b791c | 001c3d18 | 56f84af8 | 0000013b | 6d944550 | 6d505370 | 24200000 | 0007fccc |
| 1010620 | 000b47a8 | 00000038 | b27cb66c | 000000e4 | 00000121 | 000b47ac | 02000ce5 | 05001b0d | 0000375f | 00000023 | 00002c07 | 005c25c3 |
| 1010700 | 0000023b | 00002aff | 2c780064 | 0002438a | 51100000 | 0300380f | 68546aa0 | 6af0001c | 4a94001c | 35ec47a8 | 34100020 | 3bf40000 |
| 1010760 | 000b8dc8 | 00242ecc | 3df40020 | 56f84af8 | 00000113 | 67ec0018 | 34e0001c | 38fc001c | 3880320c | 3bf40000 | 000b89dc | 00143d00 |
| 1011040 | 56f84af8 | 00000113 | 640c723c | 000b485c | 00000070 | b27cb66c | 000000e5 | 00000122 | 000b47e4 | 02000ce5 | 05001b0d | 00003817 |
| 1011120 | 0000001b | 00002c07 | 005c6e43 | 0000023b | 00002aff | 000b485c | 00000038 | b27cb66c | 000000e6 | 00000123 | 000b4860 | 02000ce5 |
| 1011200 | 05001b0d | 00003767 | 00000023 | 00002c07 | 005c27a3 | 0000023b | 00002aff | 2c780044 | 0002438a | 5d100000 | 02003767 | 61100018 |
| 1011260 | 49380018 | 35ec2520 | 47a85758 | 4b8c0000 | 00000113 | 67503050 | 33bc247c | 000b8fb4 | 00143d00 | 56f84af8 | 00000113 | 640c723c |
| 1011340 | 000b4980 | 000000a8 | b27cb66c | 000000e7 | 00000124 | 000b4898 | 02000ce5 | 05001b0d | 0000381f | 0000001b | 00002c07 | 005c7da3 |
| 1011420 | 0000023b | 00002aff | 000b48cc | 00000038 | b27cb66c | 000000e8 | 00000125 | 000b48d0 | 02000ce5 | 05001b0d | 0000382f | 0000001b |
| 1011500 | 00002c07 | 005c8383 | 0000023b | 00002aff | 000b48ec | 00000020 | 00000000 | 0009d320 | 0009cf08 | 00000000 | 00000000 | 00000000 |
| 1011560 | 000b4980 | 00000018 | 00002c07 | 005c81e3 | 0000023b | 00002aff | 27f0003c | 000b493c | 56f86868 | 69b04768 | 33bc3aa0 | 000b791c |
| 1011640 | 001c4550 | 4b8c0000 | 00000113 | 537037b0 | 8d94aab4 | 0000a260 | 386c3d30 | 24200000 | 000b9108 | 29540040 | 0002438a | 56f8671c |
| 1011720 | 55f06b74 | 682c4768 | 57584af8 | 00000113 | 55f04af8 | 00000113 | 6a004550 | 6b745370 | 43000000 | 0000084f | 0007fccc | 0018231c |
| 1012000 | 000b9108 | 000b4a34 | 00000039 | b27cb66c | 000000ea | 00000127 | 000b4a38 | 02000ce5 | 05001b0d | 00003937 | 0000001b | 00002c07 |
| 1012060 | 005c8843 | 0000023b | 00002aff | 27f0003c | 000b49f0 | 56f96868 | 69b04769 | 33bc3aa0 | 000b791c | 001c4550 | 4b8c0000 | 00000113 |
| 1012140 | 537037b0 | 8d94aab4 | 0000a260 | 386c3d30 | 24200000 | 000b9108 | 28c40040 | 000b91b9 | 56f8671c | 55f06b74 | 682c4768 | 57584af8 |
| 1012220 | 00000113 | 55f04af8 | 00000113 | 6a004550 | 6b745370 | 43000000 | 0000084f | 0007fccc | 0018231c | 000b9108 | 000b4bc8 | 000000e0 |
| 1012300 | b27cb66c | 000000eb | 00000129 | 000b4a70 | 02000ce5 | 05001b0d | 000035df | 0000001b | 00002c07 | 005bc8e3 | 0000023b | 00002aff |
| 1012360 | 000b4aa4 | 00000039 | b27cb66c | 000000ec | 00000129 | 000b4aa8 | 02000ce5 | 05001b0d | 0000365f | 0000001b | 00002c07 | 005c9303 |
| 1012440 | 0000023b | 00002aff | 000b4adc | 00000038 | b27cb66c | 000000ed | 0000012a | 000b4ae0 | 02000ce5 | 05001b0d | 00003667 | 0000001b |
| 1012520 | 00002c07 | 005c9483 | 0000023b | 00002aff | 000b4bc8 | 00000038 | b27cb66c | 000000ee | 0000012b | 000b4bcc | 02000ce5 | 05001b0d |
| 1012600 | 0000383f | 0000001b | 00002c07 | 005c9183 | 0000023b | 00002aff | 28c40024 | 000b4b34 | 36903574 | 56f86c08 | 6bc84538 | 6c085370 |
| 1012660 | 56f84af8 | 000001eb | 53707220 | 28c40024 | 000b4b58 | 36903574 | 56f86c08 | 6bc84538 | 6c095370 | 56f84af8 | 000001f3 | 53707220 |
| 1012740 | 28c40024 | 000b4b7c | 36903574 | 56f86c08 | 6bc84538 | 6c085370 | 56f84af8 | 000002fb | 53707220 | 28c40024 | 000b4ba0 | 36903574 |
| 1013020 | 56f86c08 | 6bc84538 | 6c085370 | 56f84af8 | 000003e3 | 53707220 | 29540024 | 0002438a | 36903574 | 56f86c08 | 6bc84538 | 6c085370 |
| 1013100 | 56f84af8 | 00000173 | 53707220 | 000b5610 | 00000048 | b27cb66c | 000000ef | 0000012c | 0009d25c | 02000ce5 | 05001b0d | 00003847 |
| 1013160 | 0000001b | 00002c07 | 005c96c3 | 0000023b | 00002aff | 000b4c7c | 00000010 | 000b4bd0 | 00000000 | 27f00024 | 000b4c30 | 36903574 |
| 1013240 | 56f86c08 | 6bc84538 | 6c085370 | 56f84af8 | 0000010b | 53707220 | 28c40024 | 000b4c54 | 36903574 | 56f86c08 | 6bc84538 | 6c085370 |
| 1013320 | 56f84af8 | 00000123 | 53707220 | 28c40024 | 000b3450 | 36903574 | 56f86c08 | 6bc84538 | 6c085370 | 56f84af8 | 0000012b | 53707220 |
| 1013400 | 00076973 | 5f637379 | 6d004c9c | 00003357 | b328ce28 | 0009ce2c | 00000000 | 000b4c84 | 000a685c | 00086973 | 5f636e74 | 726c0054 |
| 1013460 | 00036162 | 73004cb9 | 00076d69 | 73635f6f | 700026af | 00003587 | b328088f | 000b2d40 | 00000000 | 00003357 | b328cbe8 | 0009ce84 |
| 1013540 | 00000000 | 000b7265 | 73657276 | 65642e70 | 6c000000 | 2cac4cf9 | 0002438a | 2ca0000b | 0000003c | 00000009 | 0009cf48 | 0009d0c8 |
| 1013620 | 0002438a | 0009d0f8 | 000a6c6f | 67696361 | 6c5f6f70 | 000b4d21 | 0009cf84 | 00000000 | 00026f72 | 0000022f | 000d636f | 6e666967 |
| 1013700 | 75726174 | 696f6e00 | 00076d75 | 6c745f6f | 7000088f | 0009cfe4 | 000b4d20 | 00046e61 | 6e640047 | 000aaa90 | 0100332f | 00002c07 |
| 1013760 | 00000004 | 000b4dac | 000b4dac | 00010046 | 00000000 | 0005626c | 6f636b00 | 00037573 | 65000000 | 0003786f | 72004d95 | 00066163 |
| 1014040 | 63657373 | 0000088f | 00097668 | 646c5f6c | 65787300 | 2cac000b | 0002438a | 2ca0022f | 000001fc | 00000048 | 0009ed0c | 000b55cc |
| 1014120 | 0002438a | 0009d330 | 00036275 | 73000000 | 0005616c | 69617300 | 28c40012 | 000b4e04 | 4e1c0000 | 00001aff | 228c088f | 000c6172 |
| 1014200 | 63686974 | 65637475 | 72650047 | 28c40012 | 000b4e48 | 4e1c0000 | 000033bf | 228c0387 | ffffffff | 0300358f | 00002c07 | 0000000c |
| 1014260 | 000b7644 | 000b7644 | 00010047 | 00000000 | 0004626f | 64790000 | 00056172 | 72617900 | 28c40012 | 000b4e5c | 4e1c0000 | 000033c7 |
| 1014340 | 228c088f | 28c40012 | 000b4e8c | 4e1c0000 | 00001b77 | 228c0013 | 0004766c | 65780034 | 00026765 | 00000000 | 00096174 | 74726962 |
| 1014420 | 75746500 | 28c40012 | 000b4ea8 | 4e1c0000 | 000033cf | 228c0387 | 00056265 | 67696e00 | 28c40012 | 000b4ebc | 4e1c0000 | 000033d7 |
| 1014500 | 228c2a47 | 28c40012 | 000b4ed0 | 4e1c0000 | 000033df | 228c4ed9 | 28c40012 | 000b4ef0 | 4e1c0000 | 000033e7 | 228c088f | 00066275 |
| 1014560 | 66666572 | 000b4ef9 | 28c40012 | 000b4f04 | 4e1c0000 | 000033ef | 228c088f | 28c40012 | 000b4f28 | 4e1c0000 | 000033f7 | 228c000b |
| 1014640 | 0005756e | 74696c00 | 00046361 | 7365003f | 28c40012 | 000b4f58 | 4e1c0000 | 000033ff | 228c26af | 000b51ac | 000b4f44 | 000b4dec |
| 1014720 | 00000000 | 0009636f | 6d706f6e | 656e7400 | 28c40012 | 000b4f6c | 4e1c0000 | 00003407 | 228c4f71 | 28c40012 | 000b4f80 | 4e1c0000 |
| 1015000 | 0000340f | 228c4f71 | 28c40012 | 000b4fa4 | 4e1c0000 | 00001d77 | 228c4f86 | 000a6469 | 73636f6e | 6e656374 | 00001b5f | 28c40012 |
| 1015060 | 000b4fc4 | 4e1c0000 | 00003417 | 228c4f9d | 0006646f | 776e746f | 000b4fb6 | 28c40012 | 000b4fe0 | 4e1c0000 | 0000341f | 228c2145 |
| 1015140 | 0004656c | 73650099 | 28c40012 | 000b4ffc | 4e1c0000 | 00003427 | 228c1b5f | 0005656c | 73696600 | 28c40012 | 000b5018 | 4e1c0000 |
| 1015220 | 0000342f | 228c4e59 | 0003656e | 64004e39 | 28c40012 | 000b5038 | 4e1c0000 | 00003437 | 228c501e | 0006656e | 74697479 | 000b503d |
| 1015300 | 28c40012 | 000b504c | 4e1c0000 | 0000343f | 228c502e | 28c40012 | 000b5070 | 4e1c0000 | 00001ee7 | 228c4dd1 | 00046c6f | 6f700000 |

```
1015360 00036d61 70000000 28c40012 000b508c 4e1c0000 00001f67 228c5076 0003666f 7200507e 28c40012 000b50ac 4e1c0000
1015440 00003447 228c508d 00086675 6e637469 6f6e007e 28c40012 000b50cc 4e1c0000 0000344f 228c4d15 00086765 6e657261
1015520 746500be 28c40012 000b50e0 4e1c0000 00003457 228c088f 28c40012 000b5110 4e1c0000 000020af 228c50ce 00036e65
1015600 77000000 00046e75 6c6c0000 00076775 61726465 64004c8d 28c40012 000b5124 4e1c0000 0000345f 228c5116 28c40012
1015660 000b5148 4e1c0000 0000214f 228c512d 0005616c 70686100 00026f66 00000000 28c40012 000b5164 4e1c0000 00002197
1015740 228c514e 0005696e 6f757400 28c40012 000b5178 4e1c0000 00003467 228c517d 28c40012 000b518c 4e1c0000 0000226f
1016020 228c516e 28c40012 000b51a0 4e1c0000 000022b7 228c088f 28c40012 000b51c0 4e1c0000 000022ff 228c519d 00076c69
1016100 6e6b6167 650051b2 28c40012 000b51d4 4e1c0000 0000346f 228c1669 28c40012 000b51e8 4e1c0000 00003477 228c51ca
1016160 28c40012 000b51fc 4e1c0000 0000347f 228c4af1 28c40012 000b5210 4e1c0000 00003487 228c51f2 28c40012 000b5224
1016240 4e1c0000 0000251f 228c4a91 28c40012 000b5238 4e1c0000 0000348f 228c522a 28c40012 000b524c 4e1c0000 00003497
1016320 228c4a31 28c40012 000b5268 4e1c0000 0000262f 228c06a7 00046572 72310000 28c40012 000b5298 4e1c0000 0000265f
1016400 228c4a49 00026c65 00000000 000b4ccc 000acb08 00066f74 68657273 000b52a6 28c40012 000b52b4 4e1c0000 0000349f
1016460 228c52be 00036f75 74000be3 28c40012 000b52d4 4e1c0000 000034a7 228c088f 00077061 636b6167 65004ac9 28c40012
1016540 000b5300 4e1c0000 000034af 228c4ae1 000b50ec 00000000 000b52e0 000b52e8 0004706f 7274000e 28c40012 000b5330
1016620 4e1c0000 000034b7 228c5322 00047769 74680000 0003656f 66004e79 00097072 6f636564 75726500 28c40012 000b5350
1016700 4e1c0000 000034bf 228c088f 00077072 6f636573 7300535a 28c40012 000b536c 4e1c0000 000034c7 228c088f 00057261
1016760 6e676500 28c40012 000b538c 4e1c0000 000034cf 228c4be9 00067265 636f7264 000b5375 28c40012 000b53ac 4e1c0000
1017040 000034d7 228c53aa 00087265 67697374 657200a1 28c40012 000b53cc 4e1c0000 000034df 228c53b1 00067265 706f7274
1017120 00001553 28c40012 000b53fc 4e1c0000 000034e7 228c4c31 00047768 656e0000 00057768 696c6500 00067265 7475726e
1017200 0000088f 28c40012 000b542c 4e1c0000 000034ef 228c1483 000b5588 000b5460 00047761 69740000 00067365 6c656374
1017260 000b5436 28c40012 000b544c 4e1c0000 000034f7 228c088f 00087365 76657269 7479003d 28c40012 000b5474 4e1c0000
1017340 000034ff 228c546a 000b5130 00000000 00067369 676e616c 0000088f 28c40012 000b5494 4e1c0000 00003507 228c1c63
1017420 00077375 62747970 6500549e 28c40012 000b54b0 4e1c0000 0000350f 228c088f 00047468 656e0041 28c40012 000b54cc
1017500 4e1c0000 00003517 228c54b9 0002746f 0000088f 28c40012 000b54fc 4e1c0000 0000351f 228c1483 000b521c 00000000
1017560 000b54d8 000b54e0 00097472 616e7370 6f727400 28c40012 000b5518 4e1c0000 00003527 228c088f 00047479 706500c9
1017640 28c40012 000b5534 4e1c0000 0000352f 228c5521 0005756e 69747300 28c40012 000b5548 4e1c0000 00003537 228c1483
1017720 28c40012 000b555c 4e1c0000 0000353f 228c1fa5 28c40012 000b557c 4e1c0000 00003547 228c5565 00087661 72696162
1020000 6c650093 28c40012 000b5590 4e1c0000 0000354f 228c0613 28c40012 000b55a4 4e1c0000 00003557 228c5599 28c40012
1020060 000b55b8 4e1c0000 0000355f 228c55c6 28c40012 000b55cc 4e1c0000 00003567 228c55d6 29540012 0002438a 4e1c0000
1020140 0000356f 228c088f 00087668 646c546f 6b73009c 2c780014 0002438a 57586b48 6bc822bc 000b7b2c 0009766c 65785f6c
1020220 69737400 000b56fc 00000080 b288b66c 00000130 7fffffff 0007e92d 02000ce5 0100147d 00000007 00002aff 000b5664
1020300 0000002c b288b66c 00000130 7fffffff 000b5614 02000ce5 0100147d 01002d65 0000000b 00002aff 000b56fc 0000002c
1020360 b288b66c 00000130 7fffffff 000b563c 02000ce5 0100147d 01002d65 0000000b 00002aff 002f2f68 6f6d652f 6f736173
1020440 312f612f 73726565 2f73656d 616e7469 635f6368 65636b31 2f6c6578 2f626967 73746172 74002065 00122f68 6f6d652f
1020520 6f736173 312f612f 73726565 2f73656d 616e7469 635f6368 65636b31 2f6c6578 2f626967 73746172 742e706c 000a766c
1020600 000b8d38 00001f1c 542c4e29 202d2d3e 20636f6d 6d656e74 284e2c4e 31292c20 212c2076 6c65785f 6c697374 28542c4e
1020660 31292e0a 766c6578 5f6c6973 7428542c 4e29202d 2d3e2065 6e645f6f 665f6c69 6e657328 4e2c4e31 292c2021 2c20766c
1020740 65785f6c 69737428 542c4e31 292e0a76 6c65785f 6c697374 285b487c 545d2c4e 29202d2d 3e20766c 65782848 2c4e292c
1021020 20212c20 766c6578 5f6c6973 7428542c 4e292e0a 766c6578 5f6c6973 74285b5d 2c5f2920 2d2d3e20 5b5d2e0a 0a636f6d
1021100 6d656e74 284e2c4e 3129202d 2d3e2022 2d222c20 222d222c 20212c20 63677261 70686963 5f636861 72732c20 656e645f
1021160 6f665f6c 696e6528 4e2c4e31 292e0a63 67726170 6869635f 63686172 73202d2d 3e206772 61706869 635f6368 6172285f
1021240 292c2021 2c206367 72617068 69635f63 68617273 2e0a6367 72617068 69635f63 68617273 202d2d3e 205b5d2e 0a0a0a76
1021320 6c657828 432c4e29 202d2d3e 206c6974 6572616c 28432c4e 292e0a76 6c657828 546f6b2c 4e29202d 213e2077 6f726428
1021400 57292c20 7b69645f 746f6b28 572c2054 6f6b2c20 4e297d2e 0a766c65 7828442c 4e29202d 2d3e2064 656c696d 69746572
1021460 28442c4e 292e0a76 6c657828 5f2c4e29 202d2d3e 205b4354 2c207b43 203d5c3d 202d312c 20657272 31284329 2c207772
1021540 69746528 4e292c20 61626f72 747d2e0a 0a776f72 64285b48 7c545d29 202d2d3e 20616c70 68612841 292c2021 2c207b74
1021620 6f5f6c6f 77657228 412c4829 7d2c2061 6c706861 5f6e756d 2854292e 0a616c70 68612841 29202d2d 3e205b41 5d2c207b
1021700 69735f61 6c706861 28412974 2e0a6469 67697428 4429202d 2d3e205b 445d2c20 7b69735f 64696769 74284429 7d2e0a75
1021760 6e646572 6c696e65 28552920 2d2d3e20 225f222c 207b6e61 6d652827 5f272c5b 555d297d 2e0a756e 6465726c 696e6520
1022040 2d2d3e20 225f222e 0a616c70 68615f6e 756d285b 556c696e 652c487c 545d2920 2d2d3e20 756e6465 726c696e 6528556c
1022120 696e6529 2c20616c 70686128 41292c20 210a0909 092c207b 746f5f6c 6f776572 28412c48 297d2c20 616c7068 615f6e75
1022200 6d285429 2e0a616c 7068615f 6e756d28 5b487c54 5d29202d 2d3e2061 6c706861 2841292c 20212c20 7b746f5f 6c6f7765
1022260 7228412c 48297d2c 20616c70 68615f6e 756d2854 292e0a61 6c706861 5f6e756d 285b556c 696e652c 487c545d 29202d2d
1022340 3e20756e 6465726c 696e6528 556c696e 65292c20 64696769 74284829 2c20212c 20616c70 68615f6e 756d2854 292e0a61
1022420 6c706861 5f6e756d 285b487c 545d2920 2d2d3e20 64696769 74284829 2c20212c 20616c70 68615f6e 756d2854 292e0a61
```

1022500 6c706861 5f6e756d 285b5d29 202d2d3e 205b5d2e 0a0a6964 5f746f6b 28572c20 546f6b2c 204e2920 3a2d206e 616d6528
1022560 582c2057 292c2074 6f6b2858 2c20546f 6b2c204e 292e0a0a 2f2a2074 6f6b2854 6f6b2c20 72657328 546f6b2c 4e292920
1022640 3a2d2072 65736572 76656428 546f6b29 2c20212c 206c696e 65284e29 2e202054 68697320 69732074 616b656e 20636172
1022720 65206f66 20627920 74686520 6772616d 6161722e 20492064 65636964 65642074 6f207061 73730a74 68697320 6275636b
1023000 20746f20 74686520 6772616d 6d617220 72756c65 2c207369 6e636520 7573696e 67206120 72657365 72766564 20776f72
1023060 6420666f 7220616e 20696465 6e746966 69657220 69732069 6c6c6567 616c2061 6e642074 68757320 68617320 746f2062
1023140 650a666c 61676765 64206173 20616e20 6572726f 72206166 74657220 70617273 696e6720 61742061 20686967 68657220
1023220 6c657665 6c2e0a2a 2f0a0a74 6f6b2854 6f6b2c20 4f702c20 4e29203a 2d207265 73657276 65642854 6f6b2c4f 702c4e29
1023300 2e0a746f 6b28582c 20696428 582c4e29 2c204e29 2e0a0a73 65706172 61746f72 73202d2d 3e207365 70617261 746f722c
1023360 206d6f72 655f7365 70617261 746f7273 2e0a0a73 65706172 61746f72 202d2d3e 20737061 63655f63 6861722e 0a736570
1023440 61726174 6f72202d 2d3e2066 6f726d61 745f6566 66656374 6f722e0a 0a6d6f72 655f7365 70617261 746f7273 202d2d3e
1023520 20736570 61726174 6f722c20 6d6f7265 5f736570 61726174 6f72732e 0a6d6f72 655f7365 70617261 746f7273 202d2d3e
1023600 205b5d2e 0a0a7370 6163655f 63686172 202d2d3e 20222022 2e0a6874 6162202d 2d3e2022 09222e0a 666f726d 61745f65
1023660 66666563 746f7220 2d2d3e20 68746162 2e0a656e 645f6f66 5f6c696e 6573284e 2c4e3229 202d2d3e 20656e64 5f6f665f
1023740 6c696e65 284e2c4e 31292c20 6d6f7265 5f656e64 5f6f665f 6c696e65 73284e31 2c4e3229 2e0a6d6f 72655f65 6e645f6f
1024020 665f6c69 6e657328 4e2c4e32 29202d2d 3e20656e 645f6f66 5f6c696e 65284e2c 4e31292c 206d6f72 655f656e 645f6f66
1024100 5f6c696e 6573284e 312c4e32 292e0a6d 6f72655f 656e645f 6f665f6c 696e6573 284e2c4e 29202d2d 3e205b5d 2e0a656e
1024160 645f6f66 5f6c696e 65284e2c 4e312920 2d2d3e20 5b31305d 2c20212c 207b4e31 20697320 4e2b317d 2e0a0a64 656c696d
1024240 69746572 28617272 6f77284e 292c4e29 202d2d3e 20223d3e 222e0a64 656c696d 69746572 286d6973 635f6f70 28646f75
1024320 626c655f 73746172 2c333030 2c4e292c 4e29202d 2d3e2022 2a2a222e 0a64656c 696d6974 65722876 61725f61 73736967
1024400 6e284e29 2c4e2920 2d2d3e20 223a3d22 2e0a6465 6c696d69 74657228 72656c5f 6f70286e 65712c37 30302c4e 292c4e29
1024460 202d2d3e 20222f3d 222e0a64 656c696d 69746572 2872656c 5f6f7028 67652c37 30302c4e 292c4e29 202d2d3e 20223e3d
1024540 222e0a64 656c696d 69746572 2872656c 5f6f7028 6c652c37 30302c4e 292c4e29 202d2d3e 20223c3d 222e0a64 656c696d
1024620 69746572 28626f78 284e292c 4e29202d 2d3e2022 3c3e222e 0a64656c 696d6974 65722861 64645f6f 7028616d 70657273
1024700 616e642c 3630302c 4e292c4e 29202d2d 3e202226 222e0a64 656c696d 69746572 2861706f 7374726f 70686528 4e292c4e
1024760 29202d2d 3e202227 222e0a64 656c696d 69746572 286c7061 72656e74 68284e29 2c4e2920 2d2d3e20 2228222e 200a6465
1025040 6c696d69 74657228 72706172 656e7468 284e292c 4e29202d 2d3e2022 29222e20 0a64656c 696d6974 6572286d 756c745f
1025120 6f702873 7461722c 3430302c 4e292c4e 29202d2d 3e20222a 222e0a64 656c696d 69746572 28616464 5f6f7028 706c7573
1025200 2c363030 2c4e292c 4e29202d 2d3e2022 2b222e0a 64656c69 6d697465 7228636f 6d6d6128 4e292c4e 29202d2d 3e20222c
1025260 222e0a64 656c696d 69746572 28616464 5f6f7028 6d696e75 732c3630 302c4e29 2c4e2920 2d2d3e20 222d222e 0a64656c
1025340 696d6974 65722870 6f696e74 284e292c 4e29202d 2d3e2022 2e222e0a 64656c69 6d697465 72286d75 6c745f6f 7028736c
1025420 6173682c 3430302c 4e292c4e 29202d2d 3e20222f 222e0a64 656c696d 69746572 28636f6c 6f6e284e 292c4e29 202d2d3e
1025500 20223a22 2e0a6465 6c696d69 74657228 73656d69 636f6c6f 6e284e29 2c4e2920 2d2d3e20 223b222e 0a64656c 696d6974
1025560 65722872 656c5f6f 70286c74 2c373030 2c4e292c 4e29202d 2d3e2022 3c222e0a 64656c69 6d697465 72287265 6c5f6f70
1025640 2865712c 3730302c 4e292c4e 29202d2d 3e20223d 222e0a64 656c696d 69746572 2872656c 5f6f7028 67742c37 30302c4e
1025720 292c4e29 202d2d3e 20223e22 2e0a6465 6c696d69 74657228 76626172 284e292c 4e29202d 2d3e2022 7c222e0a 0a6c6974
1026000 6572616c 28432c4e 29202d2d 3e206261 7365645f 6c697428 432c4e29 2e0a6c69 74657261 6c28432c 4e29202d 2d3e2064
1026060 6563696d 616c5f6c 69742843 2c4e292e 0a6c6974 6572616c 28432c4e 29202d2d 3e206368 61725f6c 69742843 2c4e292e
1026140 0a0a2f2a 204f7264 6572696e 67206f66 20636c61 75736573 202a2f0a 0a6c6974 6572616c 28432c4e 29202d2d 3e206269
1026220 74737472 5f6c6974 28432c4e 292e0a6c 69746572 616c2843 2c4e2920 2d2d3e20 7374725f 6c697428 432c4e29 2e0a0a64
1026300 6563696d 616c5f6c 69742864 6563696d 616c5f6c 69742849 2c522c46 2c532c45 2c4e292c 4e29202d 2d3e2069 6e742849
1026360 292c2022 2e222c20 666c6f61 7428522c 462c4e29 0a090909 09092c20 65787028 532c4529 2e0a6465 63696d61 6c5f6c69
1026440 74286465 63696d61 6c5f6c69 7428492c 302c302c 532c452c 4e292c4e 29202d2d 3e20696e 74284929 2c206578 7028532c
1026520 45292e0a 64656369 6d616c5f 6c697428 64656369 6d616c5f 6c697428 492c522c 462c302c 302c4e29 2c4e2920 2d2d3e20
1026600 696e7428 49292c20 222e222c 20666c6f 61742852 2c462c4e 292e0a64 6563696d 616c5f6c 69742864 6563696d 616c5f6c
1026660 69742849 2c302c30 2c302c30 2c4e292c 4e29202d 2d3e2069 6e742849 292e0a0a 696e7428 4929202d 2d3e2069 6e746567
1026740 65722849 6e74292c 207b6e61 6d652849 2c20496e 74297d2e 0a0a696e 74656765 72285b48 7c545d29 202d2d3e 20646967
1027020 69742848 292c2021 2c206469 67697473 2854292e 0a0a6469 67697473 285b487c 545d2920 2d2d3e20 64696769 74284829
1027100 2c20212c 20646967 69747328 54292e0a 64696769 7473285b 487c545d 29202d2d 3e20756e 6465726c 696e652c 20212c20
1027160 64696769 74284829 2c20212c 20646967 69747328 54292e0a 64696769 7473285b 5d29202d 2d3e205b 5d2e0a0a 666c6f61
1027240 7428522c 462c4e29 202d2d3e 20696e74 65677261 6c285266 2c4e292c 207b6e61 6d652852 2c526629 2c206663 6f756e74
1027320 2846290a 09090909 092c2072 65747261 63742866 636f756e 74285f29 297d2e0a 0a696e74 65677261 6c285b48 7c545d2c
1027400 5f29202d 2d3e2064 69676974 2848292c 20212c20 64696769 74732854 2c31292e 0a696e74 65677261 6c285b48 7c5f5d2c
1027460 4e29202d 2d3e2061 6c706861 2848292c 207b6572 72322c20 77726974 65284e29 2c206162 6f72747d 2e0a0a64 69676974
1027540 73285b48 7c545d2c 4e29202d 2d3e2064 69676974 2848292c 207b4e31 20697320 4e202b20 317d2c20 212c2064 69676974

| | | | | | | | | | | | | |
|---|---|---|---|---|---|---|---|---|---|---|---|---|
| 1027620 | 7328542c | 204e3129 | 2e0a6469 | 67697473 | 285b487c | 545d2c4e | 29202d2d | 3e20756e | 6465726c | 696e652c | 20212c20 | 64696769 |
| 1027700 | 74284829 | 2c207b4e | 31206973 | 204e202b | 20317d2c | 20210a09 | 0909092c | 20646967 | 69747328 | 542c4e31 | 292e0a64 | 69676974 |
| 1027760 | 73285b5d | 2c4e2920 | 2d2d3e20 | 5b5d2c20 | 7b617373 | 65727428 | 66636f75 | 6e74284e | 29297d2e | 0a0a6578 | 7028706c | 75732c45 |
| 1030040 | 29202d2d | 3e202245 | 222c2069 | 6e742845 | 292e0a65 | 78702870 | 6c75732c | 4529202d | 2d3e2022 | 45222c20 | 222b222c | 20212c20 |
| 1030120 | 696e7428 | 45292e0a | 65787028 | 6d696e75 | 732c4529 | 202d2d3e | 20224522 | 2c20222d | 222c2021 | 2c20696e | 74284529 | 2e0a0a62 |
| 1030200 | 61736564 | 5f6c6974 | 28626173 | 65645f6c | 69742842 | 2c424969 | 2c425269 | 2c462c53 | 2c452c4e | 292c4e29 | 202d2d3e | 20626173 |
| 1030260 | 65284229 | 2c202223 | 222c2062 | 61736564 | 5f696e74 | 28422c42 | 49692c5f | 2c4e290a | 0909092c | 20222e22 | 2c206261 | 7365645f |
| 1030340 | 666c6f61 | 7428422c | 462c4252 | 69292c20 | 2223222c | 20657870 | 28532c45 | 292e0a62 | 61736564 | 5f6c6974 | 28626173 | 65645f6c |
| 1030420 | 69742842 | 2c424969 | 2c425269 | 2c462c30 | 2c302c4e | 292c4e29 | 202d2d3e | 20626173 | 65284229 | 2c202223 | 222c2062 | 61736564 |
| 1030500 | 5f696e74 | 28422c42 | 49692c5f | 2c4e290a | 0909092c | 20222e22 | 2c206261 | 7365645f | 666c6f61 | 7428422c | 462c4252 | 69292c20 |
| 1030560 | 2223222e | 0a626173 | 65645f6c | 69742862 | 61736564 | 5f6c6974 | 28422c42 | 49692c30 | 2c302c53 | 2c452c4e | 292c4e29 | 202d2d3e |
| 1030640 | 20626173 | 65284229 | 2c202223 | 222c2062 | 61736564 | 5f696e74 | 28422c42 | 49692c5f | 2c4e290a | 0909092c | 20222322 | 2c206578 |
| 1030720 | 7028532c | 45292e0a | 62617365 | 645f6c69 | 74286261 | 7365645f | 6c697428 | 422c4249 | 692c302c | 302c302c | 302c4e29 | 2c4e2920 |
| 1031000 | 2d2d3e20 | 62617365 | 2842292c | 20222322 | 2c206261 | 7365645f | 696e7428 | 422c4249 | 692c5f2c | 4e292c20 | 2223222e | 0a0a6261 |
| 1031060 | 73652842 | 29202d2d | 3e20696e | 74284229 | 2e200a62 | 61736564 | 5f696e74 | 28426173 | 652c422c | 42762c4e | 29202d2d | 3e207b42 |
| 1031140 | 61736520 | 3e203136 | 202d3e20 | 65727233 | 29426173 | 65292c20 | 77726974 | 65284e29 | 202c2061 | 626f7274 | 203b2074 | 7275657d |
| 1031220 | 0a090909 | 2c206261 | 7365645f | 6e756d28 | 42617365 | 2c42762c | 4e292c20 | 7b6e616d | 6528422c | 20427629 | 7d2e0a62 | 61736564 |
| 1031300 | 5f6e756d | 28426173 | 652c5b48 | 7c545d2c | 4e29202d | 2d3e2065 | 78745f64 | 69676974 | 28426173 | 652c482c | 4e292c20 | 212c2065 |
| 1031360 | 78745f64 | 69676974 | 73284261 | 73652c54 | 2c4e292e | 0a657874 | 5f646967 | 69742842 | 6173652c | 442c4e29 | 202d2d3e | 20646967 |
| 1031440 | 69742844 | 29202c20 | 7b6c6567 | 616c5f62 | 6173655f | 64696769 | 74284261 | 73652c44 | 293b2065 | 72723428 | 44292c20 | 77726974 |
| 1031520 | 65284e29 | 2c206162 | 6f72747d | 2e0a6578 | 745f6469 | 67697428 | 42617365 | 2c412c4e | 29202d2d | 3e20616c | 70686128 | 44292c20 |
| 1031600 | 7b6c6567 | 616c5f62 | 6173655f | 616c7068 | 61284261 | 73652c44 | 292c2074 | 6f5f6c6f | 77657228 | 442c4129 | 3b206572 | 72352844 |
| 1031660 | 292c2077 | 72697465 | 284e292c | 2061626f | 72747d2e | 0a657874 | 5f646967 | 69747328 | 422c5b48 | 7c545d2c | 4e29202d | 2d3e2065 |
| 1031740 | 78745f64 | 69676974 | 28422c48 | 2c4e292c | 20212c20 | 6578745f | 64696769 | 74732842 | 2c542c4e | 292e0a65 | 78745f64 | 69676974 |
| 1032020 | 7328422c | 5b487c54 | 5d2c4e29 | 202d2d3e | 20756e64 | 65726c69 | 6e652c20 | 212c2065 | 78745f64 | 69676974 | 28422c48 | 2c4e292c |
| 1032100 | 20210a09 | 09092c20 | 6578745f | 64696769 | 74732842 | 2c542c4e | 292e0a65 | 78745f64 | 69676974 | 73285f2c | 5b5d2c5f | 29202d2d |
| 1032160 | 3e205b5d | 2e0a0a62 | 61736564 | 5f666c6f | 61742842 | 2c462c52 | 29202d2d | 3e206261 | 7365645f | 666e756d | 28422c4e | 292c207b |
| 1032240 | 6e616d65 | 28522c4e | 292c2062 | 66636f75 | 6e742846 | 292c2072 | 65747261 | 63742862 | 66636f75 | 6e74285f | 29297d2e | 0a626173 |
| 1032320 | 65645f66 | 6e756d28 | 42617365 | 2c5b487c | 545d2920 | 2d2d3e20 | 6578745f | 66646967 | 69742842 | 6173652c | 48292c20 | 212c2065 |
| 1032400 | 78745f66 | 64696769 | 74732842 | 6173652c | 542c3129 | 2e0a6578 | 745f6664 | 69676974 | 7328422c | 5b487c54 | 5d2c4e29 | 202d2d3e |
| 1032460 | 20657874 | 5f666469 | 67697428 | 422c4829 | 2c207b4e | 31206973 | 204e2b31 | 7d2c2021 | 2c206578 | 745f6664 | 69676974 | 7328422c |
| 1032540 | 542c4e31 | 292e0a65 | 78745f66 | 64696769 | 74732842 | 2c5b487c | 545d2c4e | 29202d2d | 3e20756e | 6465726c | 696e652c | 20212c20 |
| 1032620 | 6578745f | 66646967 | 69742842 | 2c48292c | 20212c20 | 7b4e3120 | 6973204e | 2b317d0a | 0909092c | 20657874 | 5f666469 | 67697473 |
| 1032700 | 28422c54 | 2c4e3129 | 2e0a6578 | 745f6664 | 69676974 | 73285f2c | 5b5d2c4e | 29202d2d | 3e205b5d | 2c207b61 | 73736572 | 74286266 |
| 1032760 | 636f756e | 74284e29 | 29712e0a | 0a636861 | 725f6c69 | 74286368 | 61725f6c | 69742843 | 6861722c | 4e292c4e | 29202d2d | 3e202227 |
| 1033040 | 222c2021 | 2c206772 | 61706869 | 635f6368 | 61722843 | 292c2022 | 27222c20 | 7b6e616d | 65284368 | 61722c5b | 435d297d | 2e0a0a62 |
| 1033120 | 69747374 | 725f6c69 | 74286269 | 745f7374 | 725f6c69 | 7428422c | 42762c4e | 292c4e29 | 202d2d3e | 20626173 | 655f7370 | 65632842 |
| 1033200 | 292c2021 | 2c202022 | 22222220 | 2c206261 | 7365645f | 696e7428 | 422c5f2c | 42762c4e | 292c2022 | 2222222e | 0a0a6261 | 73655f73 |
| 1033260 | 70656328 | 3229202d | 2d3e2022 | 42222e0a | 62617365 | 5f737065 | 63283229 | 202d2d3e | 20226222 | 2e0a6261 | 73655f73 | 70656328 |
| 1033340 | 3829202d | 2d3e2022 | 4f222e0a | 62617365 | 5f737065 | 63293829 | 202d2d3e | 20226f22 | 2e0a6261 | 73655f73 | 70656328 | 31362920 |
| 1033420 | 2d2d3e20 | 2258222e | 0a626173 | 655f7370 | 65632831 | 3629202d | 2d3e2022 | 78222e0a | 0a737472 | 5f6c6974 | 28737472 | 5f6c6974 |
| 1033500 | 28432c4e | 292c4e29 | 202d2d3e | 20222222 | 222c2021 | 2c206772 | 61706869 | 635f6368 | 61727328 | 43292c20 | 22222222 | 2e0a6772 |
| 1033560 | 61706869 | 635f6368 | 61727328 | 4329202d | 2d3e2067 | 72617068 | 5f636861 | 726c6973 | 74284c29 | 2c207b6e | 616d6528 | 432c204c |
| 1033640 | 297d2e0a | 67726170 | 6869635f | 63686172 | 6c697374 | 285b5d29 | 202d2d3e | 205b5d2e | 0a677261 | 70685f63 | 6861726c | 69737428 |
| 1033720 | 5b487c54 | 5d29202d | 2d3e2067 | 72617068 | 69635f63 | 68617228 | 48292c20 | 7b48205c | 3d3d2022 | 2222227d | 2c206772 | 6170685f |
| 1034000 | 63686172 | 73285429 | 2e0a6772 | 6170685f | 63686172 | 6c697374 | 285b4462 | 2c44627c | 545d2920 | 2d2d3e20 | 22222222 | 2c202222 |
| 1034060 | 22222c20 | 7b6e616d | 65282722 | 272c5b44 | 625d297d | 0a090909 | 092c2067 | 72617068 | 5f636861 | 72732854 | 292e0a67 | 72617068 |
| 1034140 | 5f636861 | 7273285b | 487c545d | 29202d2d | 3e206772 | 61706869 | 635f6368 | 61722848 | 292c207b | 48205c3d | 3d202222 | 22227d2c |
| 1034220 | 20677261 | 70685f63 | 68617273 | 2854292e | 0a677261 | 70685f63 | 68617273 | 285b4462 | 2c44627c | 545d2920 | 2d2d3e20 | 22222222 |
| 1034300 | 2c202222 | 22222c20 | 7b6e6161 | 65282722 | 272c5b44 | 625d297d | 2c206772 | 6170685f | 63686172 | 73285429 | 2e0a6772 | 6170685f |
| 1034360 | 63686172 | 73285b5d | 29202d2d | 3e205b5d | 2e0a0a67 | 72617068 | 69635f63 | 68617228 | 4329202d | 2d3e2061 | 6c706861 | 2843292e |
| 1034440 | 0a677261 | 70686963 | 5f636861 | 72284329 | 202d2d3e | 20646967 | 69742843 | 292e0a67 | 72617068 | 69635f63 | 68617228 | 4329202d |
| 1034520 | 2d3e2073 | 70656369 | 616c5f63 | 68617228 | 43292e0a | 67726170 | 6869635f | 63686172 | 28432920 | 2d2d3e20 | 73706163 | 655f6368 |
| 1034600 | 61722843 | 292e0a67 | 72617068 | 69635f63 | 68617228 | 4329202d | 2d3e2066 | 6f726d61 | 745f6566 | 66656374 | 6f722843 | 292e0a67 |
| 1034660 | 72617068 | 69635f63 | 68617228 | 4329202d | 2d3e206f | 74686572 | 5f737065 | 6369616c | 5f636861 | 72284329 | 2e0a0a73 | 70616365 |

```
1034740  5f636861 72284329 202d2d3e 205b435d 2c207b5b 435d203d 20222022 7d2e0a66 6f726d61 745f6566 66656374 6f722843
1035020  29202d2d 3e205b43 5d2c207b 5b435d20 3d202209 227d2e0a 0a737065 6369616c 5f636861 72284329 202d2d3e 205b435d
1035100  2c207b5b 435d203d 20202223 227d2e0a 73706563 69616c5f 63686172 28432920 2d2d3e20 5b435d2c 207b5b43 5d203d20
1035160  20222622 7d2e0a73 70656369 616c5f63 68617228 4329202d 2d3e205b 435d2c20 7b5b435d 203d2020 2227227d 2e0a7370
1035240  65636961 6c5f6368 61722843 29202d2d 3e205b43 5d2c207b 5b435d20 3d202022 2222227d 2e0a7370 65636961 6c5f6368
1035320  61722843 29202d2d 3e205b43 5d2c207b 5b435d20 3d202022 28227d2e 0a737065 6369616c 5f636861 72284329 202d2d3e
1035400  205b435d 2c207b5b 435d203d 20202229 227d2e0a 73706563 69616c5f 63686172 28432920 2d2d3e20 5b435d2c 207b5b43
1035460  5d203d20 20222a22 7d2e0a73 70656369 616c5f63 68617228 4329202d 2d3e205b 435d2c20 7b5b435d 203d2020 222b227d
1035540  2e0a7370 65636961 6c5f6368 61722843 29202d2d 3e205b43 5d2c207b 5b435d20 3d202022 2c227d2e 0a737065 6369616c
1035620  5f636861 72284329 202d2d3e 205b435d 2c207b5b 435d203d 2020222d 227d2e0a 73706563 69616c5f 63686172 28432920
1035700  2d2d3e20 5b435d2c 207b5b43 5d203d20 20227d22 7d2e0a73 70656369 616c5f63 68617228 4329202d 2d3e205b 435d2c20
1035760  7b5b435d 203d2020 222f227d 2e0a7370 65636961 6c5f6368 61722843 29202d2d 3e205b43 5d2c207b 5b435d20 3d202022
1036040  3a227d2e 0a737065 6369616c 5f636861 72284329 202d2d3e 205b435d 2c207b5b 435d203d 2020223b 227d2e0a 73706563
1036120  69616c5f 63686172 28432920 2d2d3e20 5b435d2c 207b5b43 5d203d20 20223c22 7d2e0a73 70656369 616c5f63 68617228
1036200  4329202d 2d3e205b 435d2c20 7b5b435d 203d2020 223d227d 2e0a7370 65636961 6c5f6368 61722843 29202d2d 3e205b43
1036260  5d2c207b 5b435d20 3d202022 3e227d2e 0a737065 6369616c 5f636861 72284329 202d2d3e 205b435d 2c207b5b 435d203d
1036340  2020225f 227d2e0a 73706563 69616c5f 63686172 28432920 2d2d3e20 5b435d2c 207b5b43 5d203d20 20227c22 7d2e0a73
1036420  70656369 616c5f63 68617228 4329202d 2d3e205b 435d2c20 7b5b435d 203d2022 2e227d2e 0a0a6f74 6865725f 73706563
1036500  69616c5f 63686172 28432920 2d2d3e20 5b435d2c 207b5b43 5d203d20 20222122 7d2e0a6f 74686572 5f737065 6369616c
1036560  5f636861 72284329 202d2d3e 205b435d 2c207b5b 435d203d 20202224 227d2e0a 6f746865 725f7370 65636961 6c5f6368
1036640  61722843 29202d2d 3e205b43 5d2c207b 5b435d20 3d202022 25227d2e 0a6f7468 65725f73 70656369 616c5f63 68617228
1036720  4329202d 2d3e205b 435d2c20 7b5b435d 203d2020 2240227d 2e0a6f74 6865725f 73706563 69616c5f 63686172 28432920
1037000  2d2d3e20 5b435d2c 207b5b43 5d203d20 20223f22 7d2e0a6f 74686572 5f737065 6369616c 5f636861 72284329 202d2d3e
1037060  205b435d 2c207b5b 435d203d 2020225b 227d2e0a 6f746865 725f7370 65636961 6c5f6368 61722843 29202d2d 3e205b43
1037140  5d2c207b 5b435d20 3d202022 5d227d2e 0a6f7468 65725f73 70656369 616c5f63 68617228 4329202d 2d3e205b 435d2c20
1037220  7b5b435d 203d2020 225c227d 2e200a6f 74686572 5f737065 6369616c 5f636861 72284329 202d2d3e 205b435d 2c207b5b
1037300  435d203d 2020225e 227d2e0a 6f746865 725f7370 65636961 6c5f6368 61722843 29202d2d 3e205b43 5d2c207b 5b435d20
1037360  3d202022 60227d2e 200a6f74 6865725f 73706563 69616c5f 63686172 28432920 2d2d3e20 5b435d2c 207b5b43 5d203d20
1037440  20227b22 7d2e0a6f 74686572 5f737065 6369616c 5f636861 72284329 202d2d3e 205b435d 2c207b5b 435d203d 2020227d
1037520  227d2e0a 6f746865 725f7370 65636961 6c5f6368 61722843 29202d2d 3e205b43 5d2c207b 5b435d20 3d202022 7e227d2e
1037600  200a0a65 6f66202d 2d3e205b 2d315d2e 0a0a0a2f 2a20546f 20636865 636b206c 6567616c 69747920 6f662062 61736564
1037660  5f6c6974 6572616c 73202a2f 0a0a6c65 67616c5f 62617365 5f646967 69742842 6173652c 4429203a 2d206e61 6d65284e
1037740  2c5b445d 292c204e 203c2042 6173652e 0a6c6567 616c5f62 6173655f 616c7068 61284261 73652c43 29203a2d 20746f5f
1040020  6c6f7765 7228432c 41292c20 28426173 653d3131 202d3e20 5b415d3d 2261220a 09090920 2020203b 20426173 653d3132
1040100  202d3e20 5b415d20 3c202263 220a0909 09202020 203b2042 6173653d 3133202d 3e205b41 5d203c20 22642220 0a090909
1040160  20202020 3b204261 73653d31 34202d3e 205b415d 203c2022 65220a09 09092020 20203b20 42617365 3d313520 000ca244
1040240  00000000 00057265 73657400 00003587 b128cbe8 000b2d98 00000000 00003927 b3280010 0009dbec 00000000 2c780010
1040320  0002438a 239c0000 000b7664 0007fddc 03003597 00002c07 0000000c 000b2e94 000b2e94 00010047 00000000 0000391f
1040400  b3280010 0009dbb8 00000000 ffffffff 0400359f 00002c07 00000010 000b76f4 000b7808 00010047 00000000 ffffffff
1040460  020035a7 00002c07 00000009 c009d28c 0009d28c 00010047 00000000 000a7365 70617261 746f7273 00000000 000b83dc
1040540  03003627 00003867 0000000c 0009dfd4 0009dfd4 00010049 00000000 27f00028 000b7748 45b846ec 358847e4 3348247c
1040620  000b772c 001c2ecc 38e83d6c 24100000 000b7694 ffffffff 020035af 00002c07 00000008 000b7de4 000b7de4 00010047
1040700  00000000 0007636f 6d64656e 74000000 28c40028 000b77a0 45b83574 47e43468 332c247c 000b7780 001c2ecc 38e83d6c
1040760  3d302340 000b7694 0007fe1c 040035b7 00002c07 00000010 000b2f60 000b2f60 00010047 00000000 000c656e 645f6f66
1041040  5f6c696e 65730000 28c40029 000b7808 45b83574 47e43468 332c247c 000b77d8 001c2ecc 38e83d6c 3d302340 000b7694
1041120  0307fe3c 040035bf 00002c07 c0000010 000b9020 000b8020 00010047 00000000 ffffffff 040035c7 00002c07 00000010
1041200  000b7944 000b3008 00010047 00000000 29540000 0002438a 2ca00000 00000000 00000001 000b2efc 000b782c 000b2f06
1041260  000a46e4 29540016 0002438a 4e1c0000 00000007 358848d0 72200000 000b656e 645f6f66 5f6c696e 65000000 00003917
1041340  b3280010 0009db84 00000000 0007fe5c 020035cf 00002c07 00000008 000b78e4 000b792c 00010047 00000000 ffffffff
1041420  040035d7 00002c07 00000010 000b80c0 000b80c0 00010047 00000000 000c6772 61706869 635f6369 61720000 0000390f
1041500  b3280010 0009db50 00000000 ffffffff 01003627 00002c07 00000004 000bfae0 000bfae0 00410000 00000000 27f00028
1041560  000b792c 252046ec 33a035c8 31f0247c 000b791c 00142ecc 37f03cf4 242c0000 000b7874 ffffffff 030035df 00002c07
1041640  0000000c 000b91e0 000b92b4 00010047 00000000 2954000c 0002438a 48b07220 00076c69 74657261 6c000000 27f00010
1041720  000b7980 239c0000 000b7964 0007fe7c 040035e7 00002c07 00000010 000b83fc 000b84d4 00010047 00000000 00066964
1042000  5f746f6b 00000000 28c40028 000b79f4 45c44700 35ec3664 3280247c 000b79b8 0018386c 37f03cf4 242c0000 000b79d8
```

| | | | | | | | | | | | | |
|---|---|---|---|---|---|---|---|---|---|---|---|---|
| 1042060 | 0007e6bc | 03002ce7 | 00002c07 | 0000000c | 000b7acc | 000b7acc | 00010047 | 00000000 | 0007fe9c | 030035ef | 00002c07 | 0000000c |
| 1042140 | 000b7d1c | 000b7d1c | 00010047 | 00000000 | 00096465 | 6c696d69 | 74657200 | 28c40010 | 000b3008 | 239c0000 | 000b7a14 | 0007febc |
| 1042220 | 040035f7 | 00002c07 | 00000010 | 000b80f0 | 000b80f0 | 00010047 | 00000000 | ffffffff | 010035ff | 00002c07 | 00000004 | 000b97a8 |
| 1042300 | 000b97a8 | 0001004b | 00000000 | 0008746f | 5f6c6f77 | 65720000 | 0009616c | 7068615f | 6e756d00 | 00003907 | b3280010 | 0009db1c |
| 1042360 | 00000000 | ffffffff | 03003607 | 00002c07 | 0000000c | 000b55ec | 000b55ec | 00010047 | 00000000 | ffffffff | 0200360f | 00002c07 |
| 1042440 | 00000008 | 000bfe20 | 000bfe20 | 00410000 | 00000000 | ffffffff | 03003617 | 00002c07 | 0000000c | 000b7c6c | 000b7c6c | 00010047 |
| 1042520 | 00000000 | 2cac0000 | 0002438a | 2ca00000 | 00000000 | 00000000 | 000b3074 | 000b3074 | 000b307c | 000b0c30 | 00086973 | 5f616c70 |
| 1042600 | 69610000 | 000038ff | b3280010 | 0009dae8 | 00000000 | 0004706c | 75730000 | 000b82dc | 00000000 | ffffffff | 0100361f | 00002c07 |
| 1042660 | 00000004 | 000bf9e0 | 000bf9e0 | 00410000 | 00000000 | 00086973 | 5f646967 | 69740000 | ffffffff | 03001e37 | 00002c07 | 0000000c |
| 1042740 | 000b7b78 | 000b7b78 | 00010047 | 00000000 | 000038f7 | b3280010 | 0009dab4 | 00000000 | 2c780014 | 0002438a | 57586b48 | 6bc822bc |
| 1043020 | 000b78d4 | 0009756e | 6465726c | 696e6500 | 00015f00 | ffffffff | 0300362f | 00002c07 | 0000000c | 000b7bcc | 000b7bcc | 00010047 |
| 1043100 | 00000000 | 00003fef | b3280010 | 0009da80 | 00000000 | 2c780028 | 0002438a | 57584af8 | 000002fb | 6bc84550 | 6b485370 | 42400000 |
| 1043160 | 00003637 | 239c0000 | 0007fccc | 000b7b9c | 0200362f | 00002c07 | 00000008 | 000b7c34 | 000b7c34 | 00010047 | 00000000 | 00076973 |
| 1043240 | 5f636861 | 72000000 | 2c780014 | 0002438a | 56f84af8 | 000002fb | 6b887220 | 2cac0000 | 0002438a | 2ca00000 | 00000000 | 00000000 |
| 1043320 | 000b7c20 | 000b7c20 | 000b7c2a | 000b7c58 | 00000000 | 000038e7 | b3280010 | 0009da4c | 00000000 | 2cac0000 | 0002438a | 2ca00000 |
| 1043400 | 00000000 | 00000001 | 000b3204 | 000b7cec | 000b7ca0 | 000b7c90 | 000b7cf8 | 2aa80000 | 000b7cac | 000b325a | 29c80000 | 000b7c94 |
| 1043460 | 000b320e | 2aa80000 | 000b7ce0 | 000b3292 | 28c40028 | 000b7cec | 56f8671c | 682c4768 | 33bc247c | 000b7b58 | 00182ecc | 386c3d30 |
| 1043540 | 24200000 | 000b7abc | 2b240000 | 0002438a | 000b7cc2 | 29540016 | 0002438a | 4e1c0000 | 00000007 | 357449c0 | 72200000 | 0003746f |
| 1043620 | 6b000000 | 000038df | b3280010 | 0009da18 | 00000000 | 2c780028 | 0002438a | 252046ec | 476835c8 | 3280247c | 0007fccc | 0018386c |
| 1043700 | 37f03cf4 | 242c0000 | 000b7d54 | ffffffff | 0300363f | 00002c07 | 0000000c | 000b7d74 | 000b7d8c | 00010047 | 00000000 | 000038d7 |
| 1043760 | b3280010 | 0009d9e4 | 00000000 | 27f00010 | 000b7d8c | 239c0000 | 000aaaa0 | 00026964 | 00000000 | 29540018 | 0002438a | 5d7c0000 |
| 1044040 | 02003647 | 6b48671c | 4950228c | 00097365 | 70617261 | 746f7200 | 000f6d6f | 72655f73 | 65706172 | 61746f72 | 73000000 | 000038cf |
| 1044120 | b3280010 | 0009d9b0 | 00000000 | 00047374 | 61720000 | 0003626f | 78000000 | 2c780020 | 0002438a | 252046ec | 3310247c | 000b7e14 |
| 1044200 | 001437f0 | 3cf4234c | 000b7e34 | 0007fedc | 0200364f | 00002c07 | 00000008 | 000b7e74 | 000b7eb8 | 00010047 | 00000000 | 0007e97c |
| 1044260 | 02003657 | 00002c07 | 00000008 | 000b7ef8 | 000b7f18 | 00010047 | 00000000 | 000a7370 | 6163655f | 63686172 | 00000000 | 000038c7 |
| 1044340 | b3280010 | 0009d97c | 00000000 | 00046874 | 61620000 | 00036e65 | 710035bc | 27f00010 | 000b7eb8 | 239c0000 | 000b7e94 | 0007fefc |
| 1044420 | 0200365f | 00002c07 | 00000009 | 000b7f48 | 000b7f48 | 00010047 | 00000000 | 000f666f | 726d6174 | 5f656666 | 6563746f | 72000000 |
| 1044500 | 29540010 | 0002438a | 239c0000 | 000b7ed8 | 0007ff1c | 02003667 | 00002c07 | 00000008 | 000b7fec | 000b7fec | 00010047 | 00000000 |
| 1044560 | 000038bf | b3280010 | 0009d948 | 00000000 | 27f00020 | 000b7f18 | 252046ec | 3310247c | 000b7e14 | 001437f0 | 3cf4234c | 000b7e34 |
| 1044640 | 2954000c | 0002438a | 48b07220 | 000038b7 | b3280010 | 0009d914 | 00000000 | 2c780014 | 0002438a | 56f84af8 | 00000103 | 6b887220 |
| 1044720 | 2cac0000 | 0002438a | 2ca00000 | 00000000 | 00000000 | 000b7f34 | 000b7f34 | 000b7f3e | 000b7f6c | 00000000 | 0007ff3c | 0200366f |
| 1045000 | 00002c07 | 00000008 | 000b7fb4 | 000b7fb4 | 00010047 | 00000000 | 00003627 | b4640010 | 0009d88c | 000b1670 | 2c780014 | 0002438a |
| 1045060 | 56f84af8 | 0000004b | 6b887220 | 2cac0000 | 0002438a | 2ca00000 | 00000000 | 00000000 | 000b7fa0 | 000b7fa0 | 000b7faa | 000b7fd8 |
| 1045140 | 00000000 | 000038af | b3280010 | 0009d858 | 00000000 | 2c780010 | 0002438a | 239c0000 | 000b7f80 | 00116d6f | 72655f65 | 6e645f6f |
| 1045220 | 665f6c69 | 6e657300 | 000038a7 | b3280010 | 0009d824 | 00000000 | 2c780028 | 0002438a | 252046ec | 47e43468 | 3310247c | 000b7894 |
| 1045300 | 001c38e8 | 3d6c37f0 | 3cf4234c | 000b8058 | ffffffff | 04003677 | 00002c07 | 00000010 | 000b8078 | 000b80a0 | 00010047 | 00000000 |
| 1045360 | 0000389f | b3280010 | 0009d7f0 | 00000000 | 27f00028 | 000b80a0 | 252046ec | 47e43468 | 3310247c | 000b7894 | 001c38e8 | 3d6c37f0 |
| 1045440 | 3cf4234c | 000b8058 | 29540010 | 0002438a | 48f83588 | 48d07220 | 00003897 | b3280010 | 0009d7bc | 00000000 | 2c78001e | 0002438a |
| 1045520 | 57b84af8 | 00000053 | 6c083050 | a858aaf0 | 0001aed4 | 7220e390 | 0000388f | b3280010 | 0009d788 | 00000000 | 2cac88f0 | 0002438a |
| 1045600 | 2ca0e47c | 0000003c | 0000000f | 000b35b0 | 000b839c | 0002438a | 000b3758 | 000b85bc | 000b646f | 75626c65 | 5f737461 | 7200c530 |
| 1045660 | 000a7661 | 725f6173 | 7369676e | 000b84a8 | 000a6170 | 6f737472 | 6f706865 | 000b35bc | 00067265 | 6c5f6f70 | 00000000 | 2aa80000 |
| 1045740 | 000b8170 | 000b3690 | 03003697 | 29c819fa | 000b8154 | 000b3654 | 2aa8e108 | 000b8360 | 000b36cc | 0008017c | 04003747 | 00002c07 |
| 1046020 | 00000010 | 000b8a0c | 000b8a0c | 00010047 | 00000000 | 00066164 | 645f6f70 | 00002d87 | 0009616d | 70657273 | 616e6400 | 28c40024 |
| 1046100 | 000b81ec | 5d100000 | 010036cf | 671c48f8 | 358856f8 | 4b8c0000 | 0000013b | 6c087220 | 0005706f | 696e7400 | 00086c70 | 6172656e |
| 1046160 | 74680098 | 28c40024 | 000b822c | 5d100000 | 010036d7 | 671c48f8 | 358856f8 | 4b8c0000 | 00000143 | 6c087220 | 00056d69 | 6e757300 |
| 1046240 | 0005636f | 6d6d6100 | 00087270 | 6172656e | 746800dc | 28c40024 | 000b3798 | 5d100000 | 010036df | 671c48f8 | 358856f8 | 4b8c0000 |
| 1046320 | 0000014b | 6c087220 | 2aa8822c | 000b8290 | 000b37dc | 030036bf | 29c811fc | 000b8250 | 000b3734 | 28c40024 | 000b3800 | 5d100000 |
| 1046400 | 010036f7 | 671c48f8 | 358856f8 | 4b8c0000 | 00000163 | 6c087220 | 2b242a67 | 0002438a | 000b3810 | 28c40024 | 000b3834 | 5d100000 |
| 1046460 | 01003707 | 671c48f8 | 358856f8 | 4b8c0000 | 00000173 | 6c087220 | 000b82a8 | 000b7b14 | 0005736c | 61736900 | 2b24000b | 0002438a |
| 1046540 | 000b3844 | 03003387 | 29c898bc | 000b82d0 | 000b37a8 | 0005636f | 6c6f6e00 | 28c40024 | 000b8334 | 5d100000 | 01003717 | 671c48f8 |
| 1046620 | 358856f8 | 4b8c0000 | 00000183 | 6c087220 | 000b8160 | 00000000 | 000b8300 | 000b8318 | 00097365 | 6d69636f | 6c6f6e00 | 28c40024 |
| 1046700 | 000b3868 | 5d100000 | 0100371f | 671c48f8 | 358856f8 | 4b8c0000 | 000001db | 6c087220 | 00026c74 | 00405863 | 2aa801db | 000b8374 |
| 1046760 | 000b3878 | 00026571 | 00002d87 | 2aa8dfcc | 000b8388 | 000b38ac | 00026774 | 00001e87 | 2b24312f | 0002438a | 000b38e0 | 00047662 |
| 1047040 | 61720034 | 29540024 | 0002438a | 5d100000 | 0100373f | 671c48f8 | 358856f8 | 4b8c0000 | 000003e3 | 6c087220 | 000b825c | 00000000 |
| 1047120 | 000b83a8 | 000b83c0 | 00096261 | 7165645f | 6c697400 | 000b850c | 02003627 | 00003867 | 00000008 | 0009df18 | 0009df18 | 00010049 |

```
1047200  00000000 27f00010 000b841c 239c0000 000b818c 000b6465 63696d61 6c5f6c69 7400840c 28c40010 000b8458 239c0000
1047260  000b843c 0008019c 0400374f 00002c07 00000010 000b858c 000b858c 00010047 00000000 00086369 61725f6c 6974008c
1047340  28c40010 000b8498 239c0000 000b8478 000801bc 04003757 00002c07 00000010 000b8d64 000b8d64 00010047 00000000
1047420  000a6269 74737472 5f6c6974 000abac8 28c40010 000b84d4 239c0000 000b84b8 000801fc 0400375f 00002c07 00000010
1047500  000b8dd8 000b8dd8 00010047 00000000 00077374 725f6c69 740001e3 29540010 0002438a 239c0000 000b84f4 ffffffff
1047560  04003767 00002c07 00000010 000b8fc4 000b8fc4 00010047 00000000 00036578 70004f34 000b78c4 01003627 00003867
1047640  00000004 000bdc38 000bdc38 00010049 00000000 ffffffff 030021e7 00002c07 0000000c 000b85fc 000b85fc 00010047
1047720  00000000 0007f3fc 05001fbf 00002c07 00000014 000b3bd4 000b3bd4 00010047 00000000 ffffffff 0400376f 00002c07
1050000  00000010 000b891c 000b891c 00010047 00000000 2cacc465 0002438a 2ca02143 00000000 00000001 000b3974 000b3a74
1050060  0002438a 000b8114 2aa8c484 000b85cc 000b39ec 0600374f 29c8c532 000b85b0 000b3984 2aa885b4 000b85d8 000b3a30
1050140  2b240007 0002438a 000b3a84 29540018 0002438a 4e1c0000 0000055b 52c40000 000005db 2c780020 0002438a 45b8329c
1050220  24d00000 000b862c 00143d30 24200000 0007fccc 0007f75c 030021ef 00002c07 0000000c 000b86b0 000b86b0 00010047
1050300  00000000 00066469 67697473 0000292f ffffffff 010038af 00003867 00000004 000bdbf0 000bdbf0 00010049 00000000
1050360  2c780028 0002438a 56f8671c 682c4768 33bc247c 000b7b58 00182ecc 386c3d30 24200000 000b86a0 ffffffff 03003777
1050440  00002c07 0000000c 000b8720 000b8720 00010047 00000000 2cac8690 0002438a 2ca08128 00000000 00000000 000b8668
1050520  000b8668 000b8672 000b86d4 00000000 0000361f b3280010 0009d754 00000000 00046572 72330000 000b91d0 00000000
1050600  27f00028 000b3b60 56f8671c 682c4768 33bc247c 000b7b58 00182ecc 386c3d30 24200000 000b86a0 2cac3297 0002438a
1050660  2ca0d8ec 00000000 00000001 000b86f8 000b8760 000b8754 000b8744 000b876c 2b24870c 0002438a 000b3b6a 29c886f8
1050740  000b8748 000b8702 29540016 0002438a 4e1c0000 00000007 357448c0 7220873c 0008696e 74656772 616c0046 00066663
1051020  6f756e74 00064b54 0008053c 010038a7 00003867 00000004 000bdbb8 000bdbb8 00010049 00000000 ffffffff 0400377f
1051100  00002c07 00000010 000b8820 000b8820 00010047 00000000 ffffffff 01003787 00002c07 00000004 000939e0 000939e0
1051160  00000000 00000000 00003887 b3280010 0009d720 00000000 000b8690 04003777 00002c07 00000010 000b8894 000b8894
1051240  00010047 00000000 2cace3cc 0002438a 2ca0d4c0 00000000 00000000 000b3c5c 000b3c90 000b887c 000b8844 00000000
1051320  00046572 723200c0 ffffffff c000378f 00002c07 00000000 000c4418 000c4418 0001004b 00000000 2b241b1f 0002438a
1051400  000b3c9a 29c887e4 000b8870 000b3c66 00066c69 6e65696f 00000000 2cac866c 0002438a 2ca0e3e4 00000000 00000001
1051460  000b3cfc 000b3d7c 000b88c8 000b88b8 000b3d88 2b24888c 0002438a 000b3d3a 29c8e3f0 000b88bc 000b3d06 0008051c
1051540  0100389f 00003867 00000004 000bdb80 000bdb80 00010049 00000000 27f00028 000b3df4 4e1c0000 000036ef 357435ec
1051620  57584af8 0000022b 67503664 239c0000 000b853c 2cac88cc 0002438a 2ca0888c 00000004 00000002 000b88f4 000b3e24
1051700  0002438a 000b8960 000b8a3c 2b24866c 0002438a 000b3e04 000036ef 29c8e418 000b8944 000b8904 00000000 000b8971
1051760  000b8950 00000000 000b3e30 000b8968 00046261 73650044 00096261 7365645f 696e7400 000b6261 7365645f 666c6f61
1052040  74001b9c 00003867 b3280010 0009d6f4 00000000 ffffffff 03003797 00002c07 0000000c 000b8a74 000b8a74 00010047
1052120  00000000 0008025c 0600379f 00002c07 00000018 000b421c 000b421c 00010047 00000000 0008027c 050037a7 00002c07
1052200  00000014 000b44b8 000b44b8 00010047 00000000 2cac02dc 0002438a 2ca089e4 00000000 00000001 000b3e8c 000b4060
1052260  0002438a 000b8940 2aa802d4 000b8a4c 000b3f44 07003747 29c802d4 000b8a30 000b3e9c 2aa8caac 000b8a58 000b3fe8
1052340  2b2402ce 0002438a 000b4070 c000387f b3280010 0009d688 00000000 2c780010 0002438a 239c0000 000b853c 00096261
1052420  7365645f 6e756d00 000a6973 5f6e6577 70616765 00000000 0008029c 010037af 00002c07 00000004 000b9884 000b9884
1052500  0001004b 00000000 000802bc 050037b7 00002c07 00000014 000b42b4 000b42b4 00010047 00000000 00096578 745f6469
1052560  67697400 000a6578 745f6469 67697473 00000000 000a6973 5f6e6577 6c696e65 00000000 000802dc 050037bf 00002c07
1052640  00000014 000b4324 000b436c 00010047 00000000 000802fc 050037c7 00002c07 00000014 000b43f4 000b8c3c 00010047
1052720  00000000 00106c65 67616c5f 62617365 5f646967 69740024 00046572 72340024 28c40018 000b85e4 4e1c0000 000003db
1053000  52c40000 000003eb ffffffff 020037cf 00002c07 00000008 0009d2f8 0009d2f8 00010047 00000000 0008031c 010037d7
1053060  00002c07 00000004 000b98e8 000b98e8 0001004b 00000000 00106c65 67616c5f 62617365 5f616c70 686100a4 00046572
1053140  7235008c 0008033c 020037df 00002c07 00000008 0009d568 0009d568 00010047 00000000 ffffffff 010037e7 00002c07
1053220  00000004 000b995c 000b995c 0001004b 00000000 000804fc 01003897 00003867 00000004 000bdb58 000bdb58 00010049
1053300  00000000 29540012 0002438a 54a8359c 48e00018 72208c14 000a6261 7365645f 666e756d 000b90fc 00076266 636f756e
1053360  74001b9c 000a6973 5f656e64 6c696e65 03000000 0008035c 040037ef 00002c07 00000010 000b4540 000b4540 00010047
1053440  00000000 ffffffff 010037f7 00002c07 00000004 000939e0 000939e0 00000000 00000000 000a6578 745f6664 69676974
1053520  000b8c7c 000b6578 745f6664 69676974 73000288 28c40018 000b8b68 4e1c0000 000002db 52c40000 000002eb 0008039c
1053600  040037ff 00002c07 00000010 000939e0 000939e0 00000000 00000000 ffffffff 05003807 00002c07 00000014 000b45ac
1053660  000b4644 00010047 00000000 000b9588 00000030 000b4580 00000000 000b8d50 00000008 000b8458 00000008 000b8dac
1053740  00000010 000b468c 00000000 2cac0278 0002438a 2ca0caac 00000000 00000001 000b46b8 000b46b8 0002438a 000b8d88
1054020  000b46c4 000b6269 745f7374 725f6c69 7400027c 00096261 73655f73 70656300 000a6973 5f656e64 66696c65 00000000
1054100  000803dc 03003817 00002c07 0000000c 000b8e40 000b8e40 00010047 00000000 2cac1c94 0002438a 2ca02020 00000000
1054160  00000001 000b4740 000b4740 0002438a 000b8dfc 000b474c 000804dc 0100388f 00003867 00000004 000bdae8 000bdae8
1054240  00010049 00000000 27f00020 000b8e68 4e1c0000 00000013 357456f8 4b8c0000 00000213 6bc87220 2cac1c94 0002438a
```

| | | | | | | | | | | | | |
|---|---|---|---|---|---|---|---|---|---|---|---|---|
| 1054320 | 2ca01b9c | 0000000c | 00000001 | 000b8e20 | 000b8f48 | 0002438a | 000b8f38 | 000b4820 | 28c40020 | 000b8ea4 | 4e1c0000 | 00000011 |
| 1054400 | 357456f8 | 4b8c0000 | 00000313 | 6bc87220 | 2b24025c | 0002438a | 000b8e78 | 00000013 | 29c81b9c | 000b8e88 | 000b8e10 | 28c40020 |
| 1054460 | 000b8edc | 4e1c0000 | 00000043 | 357456f8 | 4b8c0000 | 0000027b | 6bc87220 | 000b8f08 | 00000000 | 000b8f74 | 000b8ec4 | 00046172 |
| 1054540 | 63680000 | 28c40020 | 000b8f18 | 4e1c0000 | 00000043 | 357456f8 | 4b8c0000 | 0000037b | 6bc87220 | 2b24caac | 0002438a | 000b8eec |
| 1054620 | 00000043 | 29c8015d | 000b8efc | 000b8eb4 | 28c40020 | 000b8f48 | 4e1c0000 | 00000083 | 357456f8 | 4b8c0000 | 000002c3 | 6bc87220 |
| 1054700 | 000b8ecd | 00000000 | 000b8e94 | 00000000 | 29540020 | 0002438a | 4e1c0000 | 00000083 | 357456f8 | 4b8c0000 | 000003c3 | 6bc87220 |
| 1054760 | 2b241c94 | 0002438a | 000b8f58 | 00000083 | 29c80244 | 000b8f68 | 000b8f28 | 000d6772 | 61706869 | 635f6368 | 61727300 | 0000387f |
| 1055040 | b3280010 | 0009ce58 | 00000000 | 000803fc | 0300381f | 00002c07 | 0000000c | 000b900c | 000b900c | 00010047 | 00000000 | 2cac80fc |
| 1055120 | 0002438a | 2ca080fc | 00000000 | 00000001 | 000b4814 | 000b4814 | 0002438a | 000b8e64 | 000e6772 | 6170685f | 63686172 | 6c697374 |
| 1055200 | 000b021e | 0000385f | b328cbe8 | 0009d17c | 00000000 | 2c780020 | 0002438a | 45b8329c | 24d00000 | 000b903c | 00143d30 | 24200000 |
| 1055260 | 0007fccc | 0008041c | 03003827 | 00002c07 | 0000000c | 000b9118 | 000b9118 | 00010047 | 00000000 | 00106772 | 61706869 | 635f6368 |
| 1055340 | 61726c69 | 73740024 | 0008043c | 0300382f | 00002c07 | 0000000c | 000b90b0 | 000b90b0 | 00010047 | 00000000 | 27f00018 | 000b8cdc |
| 1055420 | 4e1c0000 | 00000143 | 52c40000 | 0000014b | 2c780016 | 0002438a | 4e1c0000 | 00000007 | 357448c0 | 72209074 | 2cac2020 | 0002438a |
| 1055500 | 2ca0021c | 00000000 | 00000001 | 000b9098 | 000b9098 | 0002438a | 000b90d4 | 000b90a4 | 000b6772 | 6170685f | 63686172 | 730001f9 |
| 1055560 | 000d6173 | 73657274 | 696f6e73 | 2e706c00 | 0008045c | 03003837 | 00002c07 | 0000000c | 000b9178 | 000b9178 | 00010047 | 00000000 |
| 1055640 | 2cac1b9c | 0002438a | 2ca001e8 | 00000000 | 00000000 | 000b4900 | 000b493c | 000b914c | 000b913c | 00000000 | 2b24060f | 0002438a |
| 1055720 | 000b4946 | 29c89114 | 000b9140 | 000b490a | 000b7b1c | 0100361f | 00003867 | 00000004 | 000bdab0 | 000bdab0 | 00010049 | 00000000 |
| 1056000 | 2cac912c | 0002438a | 2ca00000 | 00000000 | 00000001 | 000b49b4 | 000b91b8 | 000b91ac | 000b919c | 000b91c4 | 2b242020 | 0002438a |
| 1056060 | 000b49fa | 29c8874c | 000b91a0 | 000b49be | 29540016 | 0002438a | 4e1c0000 | 00000007 | 357448c0 | 72200000 | 0000385f | b3280010 |
| 1056140 | 0009cc70 | 00000000 | 27f00010 | 000b91f0 | 239c0000 | 000b7a7c | 28c40010 | 000b9210 | 239c0000 | 000b7b58 | 000c7370 | 65636961 |
| 1056220 | 6c5f6368 | 617200c4 | 28c40010 | 000b9240 | 239c0000 | 000b9230 | 0007e45c | 0300383f | 00002c07 | 0000000c | 000b9368 | 000b4ba0 |
| 1056300 | 00010047 | 00000000 | 28c40010 | 000b9270 | 239c0000 | 000b9260 | 000b7e84 | 0300365f | 00002c07 | 0000000c | 000b92f4 | 000b92f4 |
| 1056360 | 00010047 | 00000000 | 28c40010 | 000b92b8 | 239c0000 | 000b9290 | 000b7ec8 | 03003667 | 00002c07 | 0000000c | 000b9324 | 000b9324 |
| 1056440 | 00010047 | 00000000 | 00126f74 | 6865725f | 73706563 | 69616c5f | 63686172 | 000b8754 | 29540010 | 0002438a | 239c0000 | 000b92d8 |
| 1056520 | ffffffff | 03003847 | 00002c07 | 0000000c | 000b4c0c | 0009d230 | 00010047 | 00000000 | 00066374 | 79706573 | 00000000 | 2c780024 |
| 1056600 | 0002438a | 36903574 | 56f86c08 | 6bc84538 | 6c085370 | 56f84af8 | 00000103 | 53707220 | 00066175 | 78666e73 | 00000000 | 2c780024 |
| 1056660 | 0002438a | 36903574 | 56f86c08 | 6bc84538 | 6c085370 | 56f84af8 | 0000004b | 53707220 | 000b0b8c | 01003887 | 00003867 | 00000004 |
| 1056740 | 000bda40 | 000bda40 | 00010049 | 00000000 | 27f00024 | 000b938c | 36903574 | 56f86c08 | 6bc84538 | 6c085370 | 56f84af8 | 0000011b |
| 1057020 | 53707220 | 28c40024 | 000b93b0 | 36903574 | 56f86c08 | 6bc84538 | 6c085370 | 56f84af8 | 00000133 | 53707220 | 28c40024 | 000b93d4 |
| 1057100 | 36903574 | 56f86c08 | 6bc84538 | 6c085370 | 56f84af8 | 0000013b | 53707220 | 28c40024 | 000b93f8 | 36903574 | 56f86c08 | 6bc84538 |
| 1057160 | 6c085370 | 56f84af8 | 00000113 | 53707220 | 28c40024 | 000b941c | 36903574 | 56f86c08 | 6bc84538 | 6c085370 | 56f84af8 | 00000143 |
| 1057240 | 53707220 | 28c40024 | 000b9440 | 36903574 | 56f86c08 | 6bc84538 | 6c085370 | 56f84af8 | 0000014b | 53707220 | 28c40024 | 000b9464 |
| 1057320 | 36903574 | 56f86c08 | 6bc84538 | 6c085370 | 56f84af8 | 00000153 | 53707220 | 28c40024 | 000b9488 | 36903574 | 56f86c08 | 6bc84538 |
| 1057400 | 6c085370 | 56f84af8 | 0000015b | 53707220 | 28c40024 | 000b94ac | 36903574 | 56f86c08 | 6bc84538 | 6c085370 | 56f84af8 | 00000163 |
| 1057460 | 53707220 | 28c40024 | 000b94d0 | 36903574 | 56f86c08 | 6bc84538 | 6c085370 | 56f84af8 | 0000016b | 53707220 | 28c40024 | 000b94f4 |
| 1057540 | 36903574 | 56f86c08 | 6bc84539 | 6c085370 | 56f84af8 | 000003eb | 53707220 | 28c40024 | 000b9518 | 36903574 | 56f86c08 | 6bc84538 |
| 1057620 | 6c085370 | 56f84af8 | 0000017b | 53707220 | 28c40024 | 000b953c | 36903574 | 56f86c08 | 6bc84539 | 6c085370 | 56f84af8 | 000001d3 |
| 1057700 | 53707220 | 28c40024 | 000b9560 | 36903574 | 56f86c08 | 6bc84538 | 6c085370 | 56f84af8 | 000001db | 53707220 | 28c40024 | 000b4b10 |
| 1057760 | 36903574 | 56f86c08 | 6bc84539 | 6c085370 | 56f84af8 | 000001e3 | 53707220 | 000b9670 | 00000058 | b288b66c | 000001c8 | 7fffffff |
| 1060040 | 000c2400 | 02000ce5 | 0100147d | 01002d65 | 0000000b | 00002aff | 000b9670 | 0000002c | b288b66c | 000001c8 | 7fffffff | 000b958c |
| 1060120 | 02000ce5 | 0100147d | 01002d65 | 0000000b | 00002aff | 002d2f68 | 6f6d652f | 6f736173 | 312f612f | 73726565 | 2f73656d | 616e7469 |
| 1060200 | 635f6368 | 65636b31 | 2f6c6578 | 2f657272 | 6f727300 | 00302f68 | 6f6d652f | 6f736173 | 312f612f | 73726565 | 2f73656d | 616e7469 |
| 1060260 | 635f6368 | 65636b31 | 2f6c6578 | 2f657272 | 6f72732e | 706c002d | 0000002c | 000b0cd8 | b27cb66c | 000001ca | 7fffffff | 000bb68c |
| 1060340 | 02000ce5 | 0200293d | 000039c7 | 0000025b | 00002aff | 000b96dc | 0000002c | b288b66c | 000001c9 | 7fffffff | 000b9648 | 02000ce5 |
| 1060420 | 0100147d | 01002d65 | 0000000b | 00002aff | 0000002c | 000e9210 | b27cb66c | 0000061f | 7fffffff | 000e499c | 02000ce5 | 02001f6d |
| 1060500 | 0000474f | 00002c07 | 00002aff | 00117479 | 70655f73 | 656d616e | 74696373 | 2e706c00 | 000b971c | 0000002c | b27cb66c | 00000616 |
| 1060560 | 0000061e | 0009cbc1 | 02000ce5 | 02002385 | 0000474f | 00002c07 | 00002aff | 27f00014 | 000e6f04 | 55483678 | 001822bc | 000e8d50 |
| 1060640 | 000b9818 | 00000090 | b27cb66c | 000001cc | 000001d3 | 0009cbc1 | 02000ce5 | 02002385 | 000039c7 | 00002c07 | 00002aff | 000b9780 |
| 1060720 | 00000038 | b27cb66c | 000001cd | 000001d5 | 000b981c | 02000ce5 | 05001b0d | 000035ff | 0000000b | 00002c07 | 005bd1a3 | 0000025b |
| 1061000 | 00002aff | 000b9818 | 0000002c | b4f0b4e4 | 000001cc | 7fffffff | 0007eaad | 00000000 | 00000000 | 000b992c | 0002438a | 000c447c |
| 1061060 | 2c780040 | 0002438a | 45c43050 | 43000000 | 000039cf | 00080d0c | 00144550 | 6d505370 | 3280247c | 0007fccc | 00104064 | 00080d0c |
| 1061140 | 000c41d4 | 000039d7 | 242c0000 | 0008040c | 0026496c | 6c656761 | 6c206465 | 63696d61 | 6c206c69 | 74657261 | 6c20666f | 756e6420 |
| 1061220 | 696e206c | 696e6520 | 000b97c4 | 000b98b4 | 00000070 | b27cb66c | 000001ce | 000001d6 | 000b9854 | 02000ce5 | 05001b0d | 0000378f |
| 1061300 | 00000003 | 00002c07 | 005c4303 | 0000025b | 00002aff | 000b98b4 | 00000038 | b27cb66c | 000001cf | 000001d7 | 000b98b8 | 02000ce5 |
| 1061360 | 05001b0d | 000037af | 0000000b | 00002c07 | 005c5583 | 0000025b | 00002aff | 2c78002c | 0002438a | 45b842ac | 000039e7 | 00080d0c |

```
1061440  001039a4 00080d0c 000c41d4 000039ef 242c0000 00080d0c 000b9928 00000038 b27cb66c 000001d0 000001d8 000b992c
1061520  02000ce5 05001b0d 000037d7 0000000b 00002c07 005c5d83 0000025b 00002aff 2c78003c 0002438a 45c442ac 000039f7
1061600  00080d0c 00144550 6d505370 3280247c 0007fccc 00104064 00080d0c 000c41d4 000039ef 242c0000 00080d0c 000b9c1c
1061660  00000038 b130b66c 000001d1 000001d9 000b9785 02000ce5 05001b0d 000037e7 0000000b 00002c07 005c6063 0000025b
1061740  00002aff 2c78003c 0002438a 45c442ac 000039ff 00080d0c 00144550 6d505370 3280247c 0007fccc 00104064 00080d0c
1062020  000c41d4 000039ef 242c0000 00080d0c 235400a0 0002439a 5d100000 03003287 4b8c0000 000040af 60cc56f8 671c5370
1062100  58186530 00205c30 020031f7 6530001c 5e540000 02003ff7 66700018 5c9c001c 02000887 67ec001c 5a180000 02003ff7
1062160  6c840018 6c345878 002067ec 00205370 5c9c0020 020031f7 66c00024 00205ec0 00000024 02003fff 6c840018 6c345ec0
1062240  00000020 02000887 6c84001c 5a180000 02003fff 6c840018 6c3422bc 000cfa98 000001e0 000cc504 b27cb66c 000002ed
1062320  7fffffff 000b9f28 02000ce5 020031ed 020031e5 000040bf 02000a3d 02000885 000040cf 0000000c 02000a3d 02000885
1062400  000040d7 00000010 02000a3d 010040dd 00000014 02000a3d 02000885 000040e7 00000018 02000a3d 02000885 00003c57
1062460  0000001c 02000885 000040ef 00000020 02000a3d 020031f5 02003ff5 00000024 05003c6d 00000028 0000002c 00000030
1062540  00000034 00000038 02000a31 02000885 0000000e 01003ff5 0000002e 02000a3d 02000885 00000012 02003eb1 00000026
1062620  0000002a 02000a3d 02000885 0000001a 01003ff5 00000032 02000a3d 02000885 0000001c 02004005 00000026 00000036
1062700  02000a3d 02000885 00000022 02003ff5 00000026 0000003a 03003ab5 00000026 00000016 03003abd 0000002a 00000001
1062760  00003507 00000001 00000032 00000001 00000036 00000007 0000003a 02000a3d 020031f5 02003ffd 00000026 05003c6d
1063040  0000002a 0000002e 00000032 00000036 0000003a 02000a3d 02000885 0000000e 01003ff5 0000002e 02000a3d 02000885
1063120  00000012 02003ebd 00000026 0000002a 02000a3d 02000885 0000001a 01003ff5 00000032 02000885 0000001e 02004005
1063200  00000026 00000036 02000885 00000022 02003ff5 00000026 0000003a 00002aff 000ba0d4 00000038 b27cb66c 000002ee
1063260  0000033e 000ba048 02000ce5 05001b0d 000040bf 0000001b 00002c07 0067d163 0000027b 00002aff 2c7802d0 0002438a
1063340  5d100000 03003287 4b8c0000 000040bf 60cc56f8 671c55f0 687c0034 55f06af0 002c55f0 6af00020 55f06aa0 55f069b0
1063420  53705818 6530001c 5e540000 020031f7 65300024 5e540000 02003ff7 67ec0018 5a180000 05003c6f 67ec002c 66c00030
1063500  00286670 00205ec0 00000024 02000a3f 66c00034 00245ec0 00000034 02000887 6b7458e0 01003ff7 6c840030 5c9c0024
1063560  02000a3f 66c00034 00245ec0 00000034 02000887 6e580034 5a180000 02003ebf 6c840018 6c84002c 5c9c0024 02000a3f
1063640  66c00034 00245ec0 00000034 02000887 6e580020 5a180000 01003ff7 6c840028 5c9c0024 02000a3f 66c00034 00245ec0
1063720  00000034 02000887 6e0858e0 02004007 6c840018 6c840020 5c9c0024 02000a3f 66c00034 00245ec0 00000034 02000887
1064000  6d3c58e0 02003ff7 6c840018 6c345ec0 00000024 03003ab7 6c840018 6af00028 5a180000 03003abf 6c84002c 67ec0024
1064060  6c345878 00244af8 00003507 55f06c84 002855f0 6c840020 53705878 001c66c0 0024001c 5c9c0024 020031f7 66c00034
1064140  00245ec0 00000034 02003fff 6c840018 5a180000 05003c6f 6c84002c 6c840030 6c840028 6c840020 6c345ec0 00000024
1064220  02000a3f 66c00034 00245ec0 00000034 02000887 6b7458e0 01003ff7 6c840030 5c9c0024 02000a3f 66c00030 00245ec0
1064300  00000030 02000887 6e580034 5a180000 02003ebf 6c840018 6c84002c 5c9c0024 02000a3f 66c0002c 00245ec0 0000002c
1064360  02000887 6e580020 5a180000 01003ff7 6c840028 5c9c0024 02000887 6e0858e0 02004007 6c840018 6c840020 5878001c
1064440  67ec001c 53705ec0 0000001c 02000887 6d3c58e0 02003ff7 6c840018 6c344768 34100038 24d00000 000cfb34 003c3410
1064520  00303e70 00383c9c 00000034 000cfb54 003434a0 00243eec 0030382c 002c3c9c 00000028 000cfb74 00283410 001c3e70
1064600  00243c9c 00000020 000cfb94 002033bc 3e70001c 3c480000 000cfbb4 0018386c 3d302340 000cfbd4 000001b0 000b9a40
1064660  b27cb66c 000002ef 7fffffff 000ba3a4 02000ce5 020031ed 020031e5 000040c7 02000a31 02003645 00001d77 0000000c
1064740  02000a3d 02000885 000040d7 00000010 02000a3d 010040dd 00000014 02000a3d 02000885 000040f7 00000018 02000a3d
1065020  02000885 00003c57 0000001c 02000885 000040ef 00000020 02000a3d 020031f5 02003ff5 00000024 05003c6d 00000028
1065100  00001d77 0000002c 00000030 00000034 02000a3d 02000885 00000012 02003ebd 00000026 0000002a 02000a3d 02000885
1065160  0000001a 01003ff5 0000002e 02000a3d 02000885 0000001e 02004005 00000026 00000032 02000a3d 02000885 00000022
1065240  02003ff5 00000026 00000036 03003af5 00000026 00000016 03001d6d 0000002a 00000001 0000002e 00000001 00000032
1065320  00000007 00000036 02000a31 020031f5 02003ffd 00000026 05003c6d 0000002a 00001d77 0000002e 00000032 00000036
1065400  02000a3d 02000885 00000012 02003ebd 00000026 0000002a 02000a3d 02000885 0000001a 01003ff5 0000002e 02000885
1065460  0000001e 02004005 00000026 00000032 02000885 00000022 02003ff5 00000026 00000036 00002aff 000ba7e4 00000038
1065540  b27cb66c 000002f0 0000033f 000ba7e8 02000ce5 05001b0d 000040c7 0000001b 00002c07 0067d4c3 0000027b 00002aff
1065620  27f00294 000ba53c 5d100000 03003287 4b8c0000 000040c7 60cc56f8 671c55f0 687c0034 55f06af0 002c55f0 6af00020
1065700  55f06aa0 55f069b0 53705818 6530001c 5e540000 020031f7 65300024 5e540000 02003ff7 67ec0018 5a180000 05003c6f
1065760  67ec002c 4b8c0000 00001d77 67ec0028 66700020 5c9c0024 02000a3f 66c00030 00245ec0 00000030 02000887 6e580034
1066040  5a180000 02003ebf 6c840018 6c84002c 5c9c0024 02000a3f 66c00030 00245ec0 00000030 02000887 6e580020 5a180000
1066120  01003ff7 6c840028 5c9c0024 02000a3f 66c00030 00245ec0 00000030 02000887 6e0858e0 02004007 6c840018 6c840020
1066200  5c9c0024 02000a3f 66c00030 00245ec0 00000030 02000887 6d3c58e0 02003ff7 6c840018 6c345ec0 00000024 03003af7
1066260  6c840018 6af00028 5a180000 03001d6f 6c84002c 67ec0024 6c345878 00246c84 002855f0 6c840020 53705878 001c66c0
1066340  0024001c 5c9c0024 020031f7 66c00030 00245ec0 00000030 02003fff 6c840018 5a180000 05003c6f 6c84002c 4b8c0000
1066420  00001d77 6c840028 6c840020 6c345ec0 00000024 02000a3f 66c00030 00245ec0 00000030 02000887 6e580034 5a180000
1066500  02003ebf 6c840018 6c84002c 5c9c0024 02000a3f 66c0002c 00245ec0 0000002c 02000887 6e580020 5a180000 01003ff7
```

| | | | | | | | | | | | | |
|---|---|---|---|---|---|---|---|---|---|---|---|---|
| 1066560 | 6c840028 | 5c9c0024 | 02000887 | 6e0858e0 | 02004007 | 6c840018 | 6c840020 | 5878001c | 67ec001c | 53705ec0 | 0000001c | 02000887 |
| 1066640 | 6d3c58e0 | 02003ff7 | 6c840018 | 6c3436a4 | 47683540 | 00180038 | 362c320c | 43000000 | 00001d77 | 000cc5cc | 003c3410 | 00303e70 |
| 1066720 | 00383c9c | 00000034 | 000cfb54 | 003434a0 | 00243eec | 0030382c | 002c3c9c | 00000028 | 000cfb74 | 00283410 | 001c3e70 | 00243c9c |
| 1067000 | 00000020 | 000cfc44 | 002033bc | 3e70001c | 3c480000 | 000cfbb4 | 0018386c | 3d302340 | 000cfbd4 | 000001a0 | 000b9f28 | b27cb66c |
| 1067060 | 000002f1 | 7fffffff | 000ba7a8 | 02000ce5 | 020031ed | 020031e5 | 000040c7 | 02000a3d | 02000885 | 000040d7 | 0000000c | 02000a3d |
| 1067140 | 010040dd | 00000010 | 02000a3d | 02000885 | 000040f7 | 00000014 | 02000a3d | 02000885 | 00003c57 | 00000018 | 02000885 | 000040ef |
| 1067220 | 0000001c | 02000a3d | 020031f5 | 02003ff5 | 00000020 | 05003c6d | 00000024 | 00001d77 | 00000028 | 0000002c | 00000030 | 02000a3d |
| 1067300 | 02000885 | 0000000e | 02003ebd | 00000022 | 00000026 | 02000a3d | 02000885 | 00000016 | 01003ff5 | 0000002a | 02000a3d | 02000885 |
| 1067360 | 0000001a | 02004005 | 00000022 | 0000002e | 02000a3d | 02000885 | 0000001e | 02003ff5 | 00000022 | 00000032 | 03003af5 | 00000022 |
| 1067440 | 00000012 | 03001d6d | 00000026 | 00000001 | 0000002a | 00000001 | 0000002e | 00000007 | 00000032 | 02000a3d | 020031f5 | 02003ffd |
| 1067520 | 00000022 | 05003c6d | 00000026 | 00001d77 | 0000002a | 0000002e | 00000032 | 02000a3d | 02000885 | 0000000e | 02003ebd | 00000022 |
| 1067600 | 00000026 | 02000a3d | 02000885 | 00000016 | 01003ff5 | 0000002a | 02000885 | 0000001a | 02004005 | 00000022 | 0000002e | 02000885 |
| 1067660 | 0000001e | 02003ff5 | 00000022 | 00000032 | 00002aff | 29540264 | 0002438a | 5d100000 | 03003287 | 4b8c0000 | 000040c7 | 60cc56f8 |
| 1067740 | 671c55f0 | 687c002c | 55f06af0 | 002055f0 | 6a055f0 | 69b05370 | 58186530 | 001c5c30 | 020031f7 | 65300024 | 5e540000 | 02003ff7 |
| 1070020 | 67ec0018 | 5a180000 | 05003c6f | 67ec002c | 4b8c0000 | 00001d77 | 67ec0028 | 66700020 | 5c9c0024 | 02000a3f | 66c00030 | 00245ec0 |
| 1070100 | 00000030 | 02000887 | 6b7458e0 | 02003ebf | 6c840018 | 6c84002c | 5c9c0024 | 02000a3f | 66c00030 | 00245ec0 | 00000030 | 02000887 |
| 1070160 | 6e580020 | 5a180000 | 01003ff7 | 6c840028 | 5c9c0024 | 02000a3f | 66c00030 | 00245ec0 | 00000030 | 02000887 | 6e0858e0 | 02004007 |
| 1070240 | 6c840018 | 6c840020 | 5c9c0024 | 02000a3f | 66c00030 | 00245ec0 | 00000030 | 02000887 | 6d3c58e0 | 02003ff7 | 6c840018 | 6c345ec0 |
| 1070320 | 00000024 | 03003af7 | 6c840018 | 6af00028 | 5a180000 | 03001d6f | 6c84002c | 67ec0024 | 6c345878 | 00246c84 | 002855f0 | 6c840020 |
| 1070400 | 53705878 | 001c66c0 | 0024001c | 5c9c0024 | 020031f7 | 66c00030 | 00245ec0 | 00000030 | 02003fff | 6c840018 | 5a180000 | 05003c6f |
| 1070460 | 6c84002c | 4b8c0000 | 00001d77 | 6c840028 | 6c840020 | 6c345ec0 | 00000024 | 02000a3f | 66c00030 | 00245ec0 | 00000030 | 02000887 |
| 1070540 | 6b7458e0 | 02003ebf | 6c840018 | 6c84002c | 5c9c0024 | 02000a3f | 66c0002c | 00245ec0 | 0000002c | 02000887 | 6e580020 | 5a180000 |
| 1070620 | 01003ff7 | 6c840028 | 5c9c0024 | 02000887 | 6e0858e0 | 02004007 | 6c840018 | 6c840020 | 5878001c | 67ec001c | 53705ec0 | 0000001c |
| 1070700 | 02000887 | 6d3c58e0 | 02003ff7 | 6c840018 | 6c344768 | 34100030 | 24d00000 | 000cfb54 | 003434a0 | 00243eec | 0030382c | 002c3c9c |
| 1070760 | 00000028 | 000cfb74 | 00283410 | 001c3e70 | 00243c9c | 00000020 | 000cfc44 | 002033bc | 3e70001c | 3c480000 | 000cfbb4 | 0018386c |
| 1071040 | 31302340 | 000cfbd4 | 00000040 | 000ba3a4 | b27cb66c | 000002f2 | 7fffffff | 000ba86c | 02000ce5 | 020031ed | 020031e5 | 000040cf |
| 1071120 | 02003645 | 0000354f | 0000000c | 01003ff5 | 0000354f | 00002aff | 000ba9b0 | 00000038 | b27cb66c | 000002f3 | 00000340 | 000ba9b4 |
| 1071200 | 02000ce5 | 05001b0d | 000040cf | 0000001b | 00002c07 | 0067d9a3 | 0000027b | 00002aff | 27f0004c | 000ba8a4 | 5d100000 | 03003287 |
| 1071260 | 4b8c0000 | 000040cf | 60cc56f8 | 671c5370 | 581867b8 | 53705c30 | 01003ff7 | 4b8c0000 | 0000354f | 36a43724 | 0018362c | 320c41d4 |
| 1071340 | 0000354f | 239c0000 | 000cc5cc | 00000040 | 000ba7a8 | b27cb66c | 000002f4 | 7fffffff | 000ba8f8 | 02000ce5 | 020031ed | 020031e5 |
| 1071420 | 000040cf | 02003645 | 00003507 | 0000000c | 01003ff5 | 00003507 | 00002aff | 28c4004c | 000ba928 | 5d100000 | 03003287 | 4b8c0000 |
| 1071500 | 000040cf | 60cc56f8 | 671c5370 | 581867b8 | 53705c30 | 01003ff7 | 4b8c0000 | 00003507 | 36a43724 | 0018362c | 320c41d4 | 00003507 |
| 1071560 | 239c0000 | 000cc5cc | 00000038 | 000ba86c | b27cb66c | 000002f5 | 7fffffff | 000ba960 | 02000ce5 | 020031ed | 020031e5 | 000040cf |
| 1071640 | 00000007 | 01003ff5 | 00000007 | 00002aff | 2954002e | 0002438a | 51100000 | 03003287 | 4b8c0000 | 000040cf | 537055f0 | 671c5370 |
| 1071720 | 5d100000 | 01003ff7 | 53704960 | 228c1d7f | 00000054 | 000ba8f8 | b27cb66c | 000002f6 | 7fffffff | 000ba a40 | 02000ce5 | 020031ed |
| 1072000 | 020031e5 | 000040e7 | 02000885 | 000040ff | 0000000c | 020031f5 | 01003ff5 | 00000010 | 02000885 | 0000000e | 01003ff5 | 00000012 |
| 1072060 | 00002aff | 000baae4 | 00000038 | b27cb66c | 000002f7 | 00000341 | 000baae8 | 02000ce5 | 05001b0d | 000040e7 | 0000001b | 00002c07 |
| 1072140 | 0067dca3 | 0000027b | 00002aff | 27f00054 | 000baa70 | 5d100000 | 03003287 | 4b8c0000 | 000040e7 | 60cc56f8 | 671c5370 | 581867b8 |
| 1072220 | 53705c30 | 020031f7 | 65300018 | 5e540000 | 01003ff7 | 67b85ec0 | 00000018 | 02000887 | 6b7458e0 | 01003ff7 | 6c3422bc | 000cfd64 |
| 1072300 | 00000038 | 000ba960 | b27cb66c | 000002f8 | 7fffffff | 000baaa8 | 02000ce5 | 020031ed | 020031e5 | 000040e7 | 00000007 | 01003ff5 |
| 1072360 | 00000007 | 00002aff | 2954002e | 0002438a | 51100000 | 03003287 | 4b8c0000 | 000040e7 | 537055f0 | 671c5370 | 51100000 | 01003ff7 |
| 1072440 | 53704960 | 228c0a57 | 00000040 | 000baa40 | b27cb66c | 000002f9 | 7fffffff | 000bab6c | 02000ce5 | 020031ed | 020031e5 | 000040f7 |
| 1072520 | 02003645 | 00002197 | 0000000c | 01003ff5 | 00002197 | 00002aff | 000bad50 | 00000038 | b27cb66c | 000002fa | 00000342 | 000bad54 |
| 1072600 | 02000ce5 | 05001b0d | 000040f7 | 0000001b | 00002c07 | 0067e223 | 0000027b | 00002aff | 27f0004c | 000bab9c | 5d100000 | 03003287 |
| 1072660 | 4b8c0000 | 000040f7 | 60cc56f8 | 671c5370 | 5d1867b8 | 53705c30 | 01003ff7 | 4b8c0000 | 00002197 | 36a43724 | 0018362c | 320c41d4 |
| 1072740 | 00002197 | 239c0000 | 000cc5cc | 00000039 | 000baaa8 | b27cb66c | 000002fb | 7fffffff | 000babd4 | 02000ce5 | 020031ed | 020031e5 |
| 1073020 | 000040f7 | 00000007 | 01003ff5 | 00000007 | 00002aff | 2954002e | 0002438a | 5d100000 | 03003287 | 4b8c0000 | 000040f7 | 537055f0 |
| 1073100 | 671c5370 | 5d100000 | 01003ff7 | 53704960 | 228c017b | 00000180 | 000bab6c | b27cb66c | 000002fc | 7fffffff | 000bafcc | 02000ce5 |
| 1073160 | 020031ed | 020031e5 | 00003fbf | 02000a3d | 02000885 | 000022b7 | 0000000c | 02000a3d | 02003645 | 000034c7 | 00000010 | 02000a3d |
| 1073240 | 010036d5 | 00000014 | 02000a3d | 0000083f | 02000a3d | 02000885 | 00004107 | 00000018 | 02000a3d | 010036dd | 0000001c | 02000a3d |
| 1073320 | 02000885 | 0000410f | 00000020 | 02000a3d | 02003645 | 000033d7 | 00000024 | 02000a3d | 02000885 | 00004117 | 00000028 | 02000a3d |
| 1073400 | 02000885 | 0000411f | 0000002c | 01002d65 | 03003ead | 000034c7 | 000022b7 | 00000030 | 020031f5 | 00003ebf | 02000a3d | 02000cdd |
| 1073460 | 00000032 | 01001b75 | 01003d3d | 00000012 | 02000a3d | 02000885 | 0000001a | 03003ebd | 00000032 | 00000016 | 00000034 | 02000a3d |
| 1073540 | 02000885 | 00000022 | 01003ebd | 00000032 | 02000a3d | 02000885 | 0000002a | 01003ebd | 00000032 | 02000a3d | 0000083f | 02000a3d |
| 1073620 | 02000885 | 0000000e | 02003ff5 | 00000038 | 0000003c | 02000a3d | 02000885 | 0000002e | 02003ebd | 0000003a | 0000003e | 02000cdd |

| | | | | | | | | | | | | |
|---|---|---|---|---|---|---|---|---|---|---|---|---|
| 1073700 | 00000032 | 01001b75 | 010022b5 | 0000003a | 00002aff | 000bb39c | 00000038 | b27cb66c | 000002fd | 00000343 | 000bb3a0 | 02000ce5 |
| 1073760 | 05001b0d | 00003fbf | 0000001b | 00002c07 | 006764c3 | 0000027b | 00002aff | 27f00240 | 000bb100 | 5d100000 | 03003287 | 4b8c0000 |
| 1074040 | 00003fbf | 60cc56f8 | 671c55f0 | 687c0054 | 55f06af0 | 004455f0 | 6af0003c | 55f06af0 | 003455f0 | 6af0002c | 55f06af0 | 002455f0 |
| 1074120 | 6af0001c | 55f06a00 | 53705818 | 67b85370 | 5e540000 | 020031f7 | 4b8c0000 | 00003ebf | 5a180000 | 02000a3f | 66700018 | 5c9c0018 |
| 1074200 | 02000cdf | 69b058e0 | 01001b77 | 5a180000 | 01003d3f | 6af00050 | 5e540000 | 02000a3f | 66700018 | 5c9c0018 | 02000887 | 6e58003c |
| 1074260 | 5a180000 | 03003ebf | 6d3c6af0 | 00445fa0 | 5e540000 | 02000a3f | 66700018 | 5c9c0018 | 02000887 | 6e58002c | 5a180000 | 01003ebf |
| 1074340 | 6d3c5c30 | 02000a3f | 66700018 | 5c9c0018 | 02000887 | 6e58001c | 5a180000 | 01003ebf | 6d3c5c30 | 02000a3f | 4b8c0000 | 0000083f |
| 1074420 | 5a180000 | 02000a3f | 65300018 | 5e540000 | 02000887 | 6b7458e0 | 02003ff7 | 6530001c | 5c9c0018 | 02000a3f | 66c00020 | 00185ec0 |
| 1074500 | 00000020 | 02000887 | 6d8058e0 | 02003ebf | 6c346c84 | 001c5ec0 | 00000018 | 02000cdf | 6d3c58e0 | 01001b77 | 5a180000 | 010022b7 |
| 1074560 | 6c34477c | 34100058 | 24d00000 | 000cfeb8 | 005c3540 | 0018004c | 3f680058 | 38940054 | 382c0050 | 43000000 | 000034c7 | 000cc5cc |
| 1074640 | 005034a0 | 00403eec | 004c382c | 00483c9c | 00000044 | 000cf098 | 00442ecc | 34100038 | 3e700040 | 3af4003c | 000cfed8 | 003c34a0 |
| 1074720 | 00303eec | 0038382c | 003431f0 | 24d00000 | 000cf0d8 | 00343410 | 00283e70 | 00303c9c | 0000002c | 000cfef8 | 002c3540 | 00180020 |
| 1075000 | 3f680028 | 38940024 | 320c42ac | 000033d7 | 000cc5cc | 002433d8 | 3e700020 | 3af4001c | 000cff18 | 001c3880 | 3d3c39f8 | 000cff38 |
| 1075060 | 00103844 | 42540000 | 000022b7 | 42400000 | 000034c7 | 242c0000 | 000cc62c | 0000013c | 000babd4 | b27cb66c | 000002fe | 7fffffff |
| 1075140 | 000bb2cc | 02000ce5 | 020031ed | 020031e5 | 00003fbf | 02000a3d | 02000885 | 000022b7 | 0000000c | 02000a3d | 02003645 | 000034c7 |
| 1075220 | 00000010 | 02000a3d | 02000885 | 0000410f | 00000014 | 02000a3d | 02003645 | 000033d7 | 00000018 | 02000a3d | 0000083f | 02000a3d |
| 1075300 | 02000885 | 00004117 | 0000001c | 02000a3d | 02000885 | 0000411f | 00000020 | 01002d65 | 03003ead | 000034c7 | 000022b7 | 00000024 |
| 1075360 | 020031f5 | 00003ebf | 02000a3d | 02000cdd | 00000026 | 01001b75 | 01003d3d | 00000012 | 02000a3d | 02000885 | 00000016 | 01003ebd |
| 1075440 | 00000026 | 02000a3d | 02000885 | 0000001e | 01003ebd | 00000026 | 02000a3d | 0000083f | 02000a3d | 02000885 | 0000000e | 02003ff5 |
| 1075520 | 00000028 | 0000002c | 02000a3d | 02000885 | 00000022 | 02003ebd | 0000002a | 0000002e | 02000cdd | 00000026 | 01001b75 | 010022b5 |
| 1075600 | 0000002a | 00002aff | 295401c4 | 0002438a | 51100000 | 03003287 | 4b8c0000 | 00003fbf | 60cc56f8 | 671c55f0 | 687c0038 | 55f06af0 |
| 1075660 | 002c55f0 | 6af00024 | 55f06af0 | 001c55f0 | 6a005370 | 581867b8 | 53705c30 | 020031f7 | 4b8c0000 | 00003ebf | 5a180000 | 02000a3f |
| 1075740 | 66700018 | 5c9c0018 | 02000cdf | 69b058e0 | 01001b77 | 5a180000 | 01003d3f | 6af00034 | 5e540000 | 02000a3f | 66700018 | 5c9c0018 |
| 1076020 | 02000887 | 6e58002c | 5a180000 | 01003ebf | 6d3c5c30 | 02000a3f | 66700018 | 5c9c0018 | 02000887 | 6e58001c | 5a180000 | 01003ebf |
| 1076100 | 6d3c5c30 | 02000a3f | 4b8c0000 | 0000083f | 5a180000 | 02000a3f | 65300018 | 5e540000 | 02000887 | 6b7458e0 | 02003ff7 | 6530001c |
| 1076160 | 5c9c0018 | 02000a3f | 66c00020 | 00185ec0 | 00000020 | 02000887 | 6d8058e0 | 02003ebf | 6c346c84 | 001c5ec0 | 00000018 | 02000cdf |
| 1076240 | 6d3c58e0 | 01001b77 | 5a180000 | 010022b7 | 6c34477c | 3410003c | 24d00000 | 000cfeb8 | 00403540 | 00180030 | 3f68003c | 38940038 |
| 1076320 | 382c0034 | 43000000 | 000034c7 | 000cc5cc | 00343410 | 00283e70 | 00303c9c | 0000002c | 000cfef8 | 002c3540 | 00180020 | 3f680028 |
| 1076400 | 38940024 | 320c42ac | 000033d7 | 000cc5cc | 00242ecc | 33d83e70 | 00203c9c | 0000001c | 000cff18 | 001c3880 | 3d3c39f8 | 000cff38 |
| 1076460 | 00103844 | 42540000 | 000022b7 | 42400000 | 000034c7 | 242c0000 | 000cc62c | 000000d4 | 000bafcc | b27cb66c | 000002ff | 7fffffff |
| 1076540 | 000c0150 | 02000ce5 | 020031ed | 020031e5 | 00004107 | 02000a3d | 02000885 | 000024ff | 0000000c | 02000885 | 00004127 | 00000010 |
| 1076620 | 020031f5 | 03003ebd | 00000014 | 00000018 | 00000001 | 0000001c | 00000020 | 02000a3d | 02000885 | 0000000e | 0200412d | 00000016 |
| 1076700 | 0000001c | 02000a3d | 02003b45 | 02003ac5 | 00000024 | 03003abd | 0000001e | 00000028 | 0000002c | 00000016 | 02000a3d | 02000cdd |
| 1076760 | 00000016 | 01001b75 | 02003ac5 | 0000001a | 01004135 | 0000001e | 02000885 | 00000012 | 02003ebd | 00000016 | 00000022 | 00002aff |
| 1077040 | 000bb4e4 | 00000038 | b27cb66c | 00000300 | 00000344 | 000c022c | 02000ce5 | 05001b0d | 00004107 | 0000001b | 00002c07 | 0067f6c3 |
| 1077120 | 0000027b | 00002aff | 2c780110 | 0002438a | 51100000 | 03003287 | 4b8c0000 | 00004107 | 60cc56f8 | 671c55f0 | 682c5370 | 581867b8 |
| 1077200 | 53705c30 | 020031f7 | 6530001c | 5e540000 | 03003ebf | 66c00018 | 002455f0 | 66700020 | 5c9c001c | 02000a3f | 66c00028 | 001c5ec0 |
| 1077260 | 00000028 | 02000887 | 6b7458e0 | 0200412f | 6c840018 | 6c840020 | 5c9c001c | 02000a3f | 66c00028 | 001c5ec0 | 00000028 | 02003bd7 |
| 1077340 | 67ec0028 | 6c840018 | 5c9c0028 | 02003ac7 | 5fa058e0 | 03003abf | 6c840020 | 5f8c5ec0 | 0000001c | 02000a3f | 66c00028 | 001c5ec0 |
| 1077420 | 00000028 | 02000cdf | 6c840018 | 5a180000 | 01001b77 | 5a180000 | 02003ac7 | 6c840024 | 5a180000 | 01004137 | 6c840020 | 5c9c001c |
| 1077500 | 02000887 | 6d3c58e0 | 02003ebf | 6c840018 | 6c344768 | 33bc247c | 000cfff0 | 0018386c | 3d302340 | 000d0010 | 000bb6b4 | 00000130 |
| 1077560 | 000bb4ee | 00000393 | 000bb4f6 | 0000032b | 000bb4fe | 0000032b | 000bb506 | 0000017b | 000bb50e | 0000039b | 000bb516 | 0000032b |
| 1077640 | 000bb51e | 0000036b | 000bb526 | 0000030b | 000bb52e | 00000373 | 000bb536 | 000003a3 | 000bb53e | 0000034b | 000bb546 | 0000031b |
| 1077720 | 000bb54e | 000002fb | 000bb556 | 0000031b | 000bb55e | 00000343 | 000bb565 | 0000032b | 000bb56e | 0000031b | 000bb576 | 0000035b |
| 1100000 | 000bb57e | 0000018b | 000bb586 | 0000017b | 000bb58e | 000bb5bc | 0000002c | b288b66c | 00000199 | 7fffffff | 000bffb8 | 02000ce5 |
| 1100060 | 0100147d | 01002d65 | 0000000b | 00002aff | 000bb5e8 | 0000002c | b288b66c | 00000199 | 7fffffff | 000bb594 | 02000ce5 | 0100147d |
| 1100140 | 01002d65 | 0000000b | 00002aff | 000bb6b4 | 0000002c | b288b66c | 00000199 | 7fffffff | 000bb5c0 | 02000ce5 | 0100147d | 01002d65 |
| 1100220 | 0000000b | 00002aff | 00352f68 | 6f6d652f | 6f736173 | 322f622f | 7175696e | 7475732f | 67656e65 | 7269632f | 71706c69 | 62322e35 |
| 1100300 | 2f6c6962 | 72617279 | 2f6c696e | 65696f00 | 00382f68 | 6f6d652f | 6f736173 | 322f622f | 7175696e | 7475732f | 67656e65 | 7269632f |
| 1100360 | 71706c69 | 62322e35 | 2f6c6962 | 72617279 | 2f6c696e | 65696f2e | 706c0032 | 0000002c | 000b9648 | b27cb66c | 0000019b | 7fffffff |
| 1100440 | 0009ce54 | 02000ce5 | 0200293d | 0000395f | 00000253 | 00002aff | 000bb910 | 00000058 | b288b66c | 0000019a | 7fffffff | 000bb68c |
| 1100520 | 02000ce5 | 0100147d | 01002d65 | 0000000b | 00002aff | 000bb910 | 0000002c | b288b66c | 0000019a | 7fffffff | 000bb6b8 | 02000ce5 |
| 1100600 | 0100147d | 01002d65 | 0000000b | 00002aff | 0000002c | 0009d178 | b27cb66c | 000001b3 | 7fffffff | 0009d684 | 02000ce5 | 02001f6d |
| 1100660 | 0000395f | 0000386f | 00002aff | 29540012 | 0002438a | 4e1c0000 | 00000007 | 228c0000 | 0000002c | 0009d6c4 | b27cb66c | 000001b4 |
| 1100740 | 7fffffff | 000a25a5 | 02000ce5 | 0200218d | 00002c07 | 0000386f | 00002aff | 0000002c | 0009d6f0 | b27cb66c | 0000019f | 7fffffff |

| | | | | | | | | | | | | |
|---|---|---|---|---|---|---|---|---|---|---|---|---|
| 1101020 | 000a0f6d | 02000ce5 | 020024a5 | 0000386f | 0000395f | 00002aff | 00000034 | 0009dc50 | b27cb66c | 000001a0 | 7fffffff | 000bb7dc |
| 1101100 | 02000ce5 | 04002105 | 00003967 | 0000000b | 0000386f | 00001ef7 | 00002aff | 00000034 | 000bb7a8 | b27cb66c | 000001a1 | 7fffffff |
| 1101160 | 000bb810 | 02000ce5 | 04002105 | 0000396f | 00000013 | 0000386f | 00001ef7 | 00002aff | 00000034 | 000bb7dc | b27cb66c | 000001a2 |
| 1101240 | 7fffffff | 000bb844 | 02000ce5 | 04002105 | 00003967 | 00000013 | 0000386f | 00001ef7 | 00002aff | 00000034 | 000bb810 | b27cb66c |
| 1101320 | 000001a3 | 7fffffff | 000bb878 | 02000ce5 | 04002105 | 0000396f | 0000001b | 0000386f | 00001ef7 | 00002aff | 00000034 | 000bb844 |
| 1101400 | b27cb66c | 000001a4 | 7fffffff | 000bb8ac | 02000ce5 | 04002105 | 00003977 | 0000000b | 0000386f | 00001ef7 | 00002aff | 00000034 |
| 1101460 | 000bb878 | b27cb66c | 000001a5 | 7fffffff | 000bb8e0 | 02000ce5 | 04002105 | 0000397f | 0000000b | 0000386f | 00001ef7 | 00002aff |
| 1101540 | 00000034 | 000bb8ac | b27cb66c | 000001a6 | 7fffffff | 000707c9 | 02000ce5 | 04002105 | 00003987 | 00000003 | 0000386f | 00001ef7 |
| 1101620 | 00002aff | 000bba70 | 0000010c | b27cb66c | 000001a7 | 000001b5 | 000bb978 | 02000ce5 | 05001b0d | 0000319f | 0000000b | 0000386f |
| 1101700 | 00610663 | 00000253 | 00002aff | 000bb974 | 0000002c | b4f0b4e4 | 000001a6 | 7fffffff | 0007eaad | 00000000 | 00000000 | 000bbbd0 |
| 1101760 | 0002438a | 000c2330 | 000bb9ac | 00000038 | b27cb66c | 000001a9 | 000001b6 | 000bb9b0 | 02000ce5 | 05001b0d | 00003967 | 0000000b |
| 1102040 | 0000386f | 0060fe43 | 00000251 | 00002aff | 000bb9e4 | 00000038 | b27cb66c | 000001aa | 000001b7 | 000bb9e8 | 02000ce5 | 05001b0d |
| 1102120 | 00003967 | 00000013 | 0000386f | 00610043 | 00000253 | 00002aff | 000bba70 | 00000038 | b27cb66c | 000001ab | 000001b8 | 000bba74 |
| 1102200 | 02000ce5 | 05001b0d | 0000398f | 00000013 | 0000386f | 00610b23 | 00000253 | 00002aff | 2c780054 | 0002438a | 45d046d8 | 329c247c |
| 1102260 | 0007f58c | 0018aa34 | aab40020 | a38c0026 | aa34aab4 | 0009a2bc | 001caa34 | aab40005 | a2bc0012 | 379c4c70 | 00000007 | 37884a7c |
| 1102340 | 000c723c | 379c56f8 | 6150671c | 37dc234c | 000c2164 | 000bbad4 | 00000038 | b27cb66c | 000001ac | 000001b9 | 000bbad8 | 02000ce5 |
| 1102420 | 05001b0d | 0000396f | 00000013 | 0000386f | 0060ff43 | 00000253 | 00002aff | 2c78002a | 0002438a | 252046d8 | 33d8332c | 24d00000 |
| 1102500 | 000c2028 | 0018aa50 | aab40000 | a3ec3d00 | 4a7c000c | 723c726f | 000bbb5c | 00000038 | b27cb66c | 000001ad | 000001ba | 000bbb60 |
| 1102560 | 02000ce5 | 05001b0d | 0000396f | 0000001b | 0000386f | 00610143 | 00000253 | 00002aff | 2c780050 | 0002438a | 45e80020 | 47004740 |
| 1102640 | 32f0001c | 24d00000 | 0007ef8c | 00243c9c | 00000020 | 000804ec | 0020332c | 32d4247c | 000c2164 | 0020411c | 0000001c | 0008054c |
| 1102720 | 001c3d18 | 4a7c0014 | 3d004a7c | 000c723c | 000bbc3c | 000000a8 | b27cb66c | 000001ae | 000001bb | 000bbb98 | 02000ce5 | 05001b0d |
| 1103000 | 0000397f | 0000000b | 0000386f | 00610343 | 00000253 | 00002aff | 000bbbcc | 00000038 | b27cb66c | 000001af | 000001bc | 000bbbd0 |
| 1103060 | 02000ce5 | 05001b0d | 00003977 | 0000000b | 0000386f | 00610243 | 00000253 | 00002aff | 000bbc3c | 00000038 | b130b66c | 000001b0 |
| 1103140 | 000001bd | 000bb94d | 02000ce5 | 05001b0d | 00003987 | 00000003 | 0000386f | 00610443 | 00000253 | 00002aff | 2c780038 | 0002438a |
| 1103220 | 2520247c | 0008036c | 00103280 | 24d00000 | 0007f58c | 0010aa18 | aab40020 | a354aa18 | aab40009 | a260aa18 | aab40005 | a2602eb0 |
| 1103300 | 000bffb4 | 0000195c | 7273696f | 6e206f66 | 206c6962 | 72617279 | 28637479 | 70657329 | 20757369 | 6e672074 | 69652066 | 6f6c6c6f |
| 1103360 | 77696e67 | 20636f64 | 653a0a0a | 0974656c | 6c286269 | 7473292c | 0a096973 | 5f617363 | 69692843 | 292c0a09 | 28202020 | 69735f64 |
| 1103440 | 69676974 | 28432920 | 2d3e2044 | 20697320 | 43202d20 | 30273020 | 2b202020 | 20202038 | 27303430 | 300a093b | 20202069 | 735f7570 |
| 1103520 | 70657228 | 4329202d | 3e204d20 | 69732043 | 202d2030 | 2741202b | 20313020 | 2b203827 | 31303030 | 0a093b20 | 20206973 | 5f6c6f77 |
| 1103600 | 65722843 | 29202d3e | 204d2069 | 73204320 | 2d203027 | 61202b20 | 3130202b | 20382732 | 3030300a | 093b2020 | 2069735f | 6373796d |
| 1103660 | 66284329 | 202d3e20 | 4d206973 | 20382734 | 3037370a | 093b2020 | 2043203d | 3a3d2022 | 20222020 | 202d3e20 | 4d206973 | 20382730 |
| 1103740 | 3237370a | 093b2020 | 2069735f | 73706163 | 65284329 | 202d3e20 | 4d206973 | 20382730 | 3337370a | 093b2020 | 2069735f | 636e7472 |
| 1104020 | 6c284329 | 202d3e20 | 4d206973 | 20382730 | 3137370a | 093b0909 | 2020204d | 20697320 | 38273030 | 37370a09 | 292c0a09 | 666f726d |
| 1104100 | 61742827 | 62697473 | 287e7c7e | 747e647e | 332b2c20 | 3227277e | 7c7e6030 | 747e3272 | 7e31322b | 292e7e6e | 272c205b | 432c4d5d |
| 1104160 | 272c0a09 | 6661696c | 0a202020 | 203b0974 | 6f6c642e | 0a2a2f0a | 0a626974 | 73282020 | 302c2032 | 27303030 | 30303131 | 31313131 |
| 1104240 | 31292e0a | 62697473 | 28202031 | 2c203227 | 30303030 | 30313131 | 31313131 | 292e0a62 | 69747328 | 2020322c | 20322730 | 30303030 |
| 1104320 | 31313131 | 31313129 | 2e0a6269 | 74732820 | 20332c20 | 32273030 | 30303031 | 31313131 | 3131292e | 0a626974 | 73282020 | 342c2032 |
| 1104400 | 27303030 | 30303131 | 31313131 | 31292e0a | 62697473 | 28202035 | 2c203227 | 30303030 | 30313131 | 31313131 | 292e0a62 | 69747328 |
| 1104460 | 2020362c | 20322730 | 30303030 | 31313131 | 31313129 | 2e0a6269 | 74732820 | 20372c20 | 32273030 | 30303031 | 31313131 | 3131292e |
| 1104540 | 0a626974 | 73282020 | 382c2032 | 27303030 | 30303131 | 31313131 | 31292e0a | 62697473 | 28202039 | 2c203227 | 30303030 | 31313131 |
| 1104620 | 31313131 | 292e0a62 | 69747328 | 2031302c | 20322730 | 30303031 | 31313131 | 31313129 | 2e0a6269 | 74732820 | 31312c20 | 32273030 |
| 1104700 | 30303131 | 31313131 | 3131292e | 0a626974 | 73282031 | 322c2032 | 27303030 | 30313131 | 31313131 | 31292e0a | 62697473 | 28203133 |
| 1104760 | 2c203227 | 30303030 | 31313131 | 31313131 | 292e0a62 | 69747328 | 2031342c | 20322730 | 30303030 | 31313131 | 31313129 | 2e0a6269 |
| 1105040 | 74732820 | 31352c20 | 32273030 | 30303031 | 31313131 | 3131292e | 0a626974 | 73282031 | 362c2032 | 27303030 | 30303131 | 31313131 |
| 1105120 | 31292e0a | 62697473 | 28203137 | 2c203227 | 30303030 | 30313131 | 31313131 | 292e0a62 | 69747328 | 2031382c | 20322730 | 30303030 |
| 1105200 | 31313131 | 31313129 | 2e0a6269 | 74732820 | 31392c20 | 32273030 | 30303031 | 31313131 | 3131292e | 0a626974 | 73282032 | 302c2032 |
| 1105260 | 27303030 | 30303131 | 31313131 | 31292e0a | 62697473 | 28203231 | 2c203227 | 30303030 | 30313131 | 31313131 | 292e0a62 | 69747328 |
| 1105340 | 2032322c | 20322730 | 30303030 | 31313131 | 31313129 | 2e0a6269 | 74732820 | 32332c20 | 32273030 | 30303031 | 31313131 | 3131292e |
| 1105420 | 0a626974 | 73282032 | 342c2032 | 27303030 | 30303131 | 31313131 | 31292e0a | 62697473 | 28203235 | 2c203227 | 30303030 | 30313131 |
| 1105500 | 31313131 | 292e0a62 | 69747328 | 2032362c | 20322730 | 30303030 | 31313131 | 31313129 | 2e0a6269 | 74732820 | 32372c20 | 32273030 |
| 1105560 | 30303031 | 31313131 | 3131292e | 0a626974 | 73282032 | 382c2032 | 27303030 | 30303131 | 31313131 | 31292e0a | 62697473 | 28203239 |
| 1105640 | 2c203227 | 30303030 | 30313131 | 31313131 | 292e0a62 | 69747328 | 2033302c | 20322730 | 30303030 | 31313131 | 31313129 | 2e0a6269 |
| 1105720 | 74732820 | 33312c20 | 32273030 | 30303131 | 31313131 | 3131292e | 0a626974 | 73282033 | 322c2032 | 27303030 | 30313031 | 31313131 |
| 1106000 | 31292e0a | 62697473 | 28203333 | 2c203227 | 30303030 | 30303131 | 31313131 | 292e0a62 | 69747328 | 2033342c | 20322730 | 30303030 |
| 1106060 | 30313131 | 31313129 | 2e0a6269 | 74732820 | 33352c20 | 32273030 | 30303030 | 31313131 | 3131292e | 0a626974 | 73282033 | 362c2032 |

| | | | | | | | | | | | | |
|---|---|---|---|---|---|---|---|---|---|---|---|---|
| 1106140 | 27303030 | 30303031 | 31313131 | 31292e0a | 62697473 | 28203337 | 2c203227 | 30303030 | 30303131 | 31313131 | 292e0a62 | 69747328 |
| 1106220 | 2033382c | 20322730 | 30303030 | 30313131 | 31313129 | 2e0a6269 | 74732820 | 33392c20 | 32273030 | 30303030 | 31313131 | 3131292e |
| 1106300 | 0a626974 | 73282034 | 302c2032 | 27303030 | 30303031 | 31313131 | 31292e0a | 62697473 | 28203431 | 2c203227 | 30303030 | 30303131 |
| 1106360 | 31313131 | 292e0a62 | 69747328 | 2034322c | 20322730 | 30303030 | 30313131 | 31313129 | 2e0a6269 | 74732820 | 34332c20 | 32273030 |
| 1106440 | 30303030 | 31313131 | 3131292e | 0a626974 | 73282034 | 342c2032 | 27303030 | 30303031 | 31313131 | 31292e0a | 62697473 | 28203435 |
| 1106520 | 2c203227 | 30303030 | 30303131 | 31313131 | 292e0a62 | 69747328 | 2034362c | 20322730 | 30303030 | 30313131 | 31313129 | 2e0a6269 |
| 1106600 | 74732820 | 34372c20 | 32273030 | 30303030 | 31313131 | 3131292e | 0a626974 | 73282034 | 382c2032 | 27303030 | 31303030 | 30303030 |
| 1106660 | 30292e0a | 62697473 | 28203439 | 2c203227 | 30303031 | 30303030 | 30303031 | 292e0a62 | 69747328 | 2035302c | 20322730 | 30303130 |
| 1106740 | 30303030 | 30313029 | 2e0a6269 | 74732820 | 35312c20 | 32273030 | 30313030 | 30303030 | 3131292e | 0a626974 | 73282035 | 322c2032 |
| 1107020 | 27303030 | 31303030 | 30303130 | 30292e0a | 62697473 | 28203533 | 2c203227 | 30303031 | 30303030 | 30313031 | 292e0a62 | 69747328 |
| 1107100 | 2035342c | 20322730 | 30303130 | 30303030 | 31311029 | 2e0a6269 | 74732820 | 35352c20 | 32273030 | 30313030 | 30303031 | 3131292e |
| 1107160 | 0a626974 | 73282035 | 362c2032 | 27303030 | 31303030 | 30313030 | 30292e0a | 62697473 | 28203537 | 2c203227 | 30303031 | 30303030 |
| 1107240 | 31303031 | 292e0a62 | 69747328 | 2035382c | 20322730 | 30303030 | 30313131 | 31313129 | 2e0a6269 | 74732820 | 35392c20 | 32273030 |
| 1107320 | 30303030 | 31313131 | 3131292e | 0a626974 | 73282036 | 302c2032 | 27303030 | 30303031 | 31313131 | 31292e0a | 62697473 | 28203631 |
| 1107400 | 2c203227 | 30303030 | 30303131 | 31313131 | 292e0a62 | 69747328 | 2036322c | 20322730 | 30303030 | 30313131 | 31313129 | 2e0a6269 |
| 1107460 | 74732820 | 36332c20 | 32273030 | 30303030 | 31313131 | 3131292e | 0a626974 | 73282036 | 342c2032 | 27303030 | 30303031 | 31313131 |
| 1107540 | 31292e0a | 62697473 | 28203635 | 2c203227 | 30303130 | 30303030 | 31303130 | 292e0a62 | 69747328 | 2036362c | 20322730 | 30313030 |
| 1107620 | 30303031 | 30313129 | 2e0a6269 | 74732820 | 36372c20 | 32273030 | 31303030 | 30303131 | 3030292e | 0a626974 | 73282036 | 382c2032 |
| 1107700 | 27303031 | 30303030 | 30313130 | 31292e0a | 62697473 | 28203639 | 2c203227 | 30303130 | 30303030 | 31313130 | 292e0a62 | 69747328 |
| 1107760 | 2037302c | 20322730 | 30313030 | 30303031 | 31313129 | 2e0a6269 | 74732820 | 37312c20 | 32273030 | 31303030 | 30313030 | 3030292e |
| 1110040 | 0a626974 | 73282037 | 322c2032 | 27303031 | 30303030 | 31303030 | 31292e0a | 62697473 | 28203733 | 2c203227 | 30303130 | 30303031 |
| 1110120 | 30303130 | 292e0a62 | 69747328 | 2037342c | 20322730 | 30313030 | 30303130 | 30313129 | 2e0a6269 | 74732820 | 37352c20 | 32273030 |
| 1110200 | 31303030 | 30313031 | 3030292e | 0a626974 | 73282037 | 362c2032 | 27303031 | 30303030 | 31303130 | 31292e0a | 62697473 | 28203737 |
| 1110260 | 2c203227 | 30303130 | 30303031 | 30313130 | 292e0a62 | 69747328 | 2037382c | 20322730 | 30313030 | 30303130 | 31313129 | 2e0a6269 |
| 1110340 | 74732820 | 37392c20 | 32273030 | 31303030 | 30313130 | 3030292e | 0a626974 | 73282038 | 302c2032 | 27303031 | 30303030 | 31313030 |
| 1110420 | 31292e0a | 62697473 | 28203831 | 2c203227 | 30303130 | 30303031 | 31303130 | 292e0a62 | 69747328 | 2038322c | 20322730 | 30313030 |
| 1110500 | 30303131 | 30313129 | 2e0a6269 | 74732820 | 38332c20 | 32273030 | 31303030 | 30313131 | 3030292e | 0a626974 | 73282038 | 342c2032 |
| 1110560 | 27303031 | 30303030 | 31313130 | 31292e0a | 62697473 | 28203835 | 2c203227 | 30303130 | 30303031 | 31313130 | 292e0a62 | 69747328 |
| 1110640 | 2038362c | 20322730 | 30313030 | 30303131 | 31313129 | 2e0a6269 | 74732820 | 38372c20 | 32273030 | 31303030 | 31303030 | 3030292e |
| 1110720 | 0a626974 | 73282038 | 382c2032 | 27303031 | 30303031 | 30303030 | 31292e0a | 62697473 | 28203839 | 2c203227 | 30303130 | 30303130 |
| 1111000 | 30303130 | 292e0a62 | 69747328 | 2039302c | 20322730 | 30313030 | 30313030 | 30313129 | 2e0a6269 | 74732820 | 39312c20 | 32273030 |
| 1111060 | 30303030 | 31313131 | 3131292e | 0a626974 | 73282039 | 322c2032 | 27303030 | 30303031 | 31313131 | 31292e0a | 62697473 | 28203933 |
| 1111140 | 2c203227 | 30303030 | 30303131 | 31313131 | 292e0a62 | 69747328 | 2039342c | 20322730 | 30303030 | 30313131 | 31313129 | 2e0a6269 |
| 1111220 | 74732820 | 39352c32 | 27313030 | 30303030 | 31313131 | 3131292e | 0a626974 | 73282039 | 362c2032 | 27303030 | 30303031 | 31313131 |
| 1111300 | 31292e0a | 62697473 | 28203937 | 2c203227 | 30313030 | 30303030 | 31303130 | 292e0a62 | 69747328 | 2039382c | 20322730 | 31303030 |
| 1111360 | 30303031 | 30313129 | 2e0a6269 | 74732820 | 39392c20 | 32273031 | 30303030 | 30303131 | 3030292e | 0a626974 | 73283130 | 302c2032 |
| 1111440 | 27303130 | 30303030 | 30313130 | 31292e0a | 62697473 | 28313031 | 2c203227 | 30313030 | 30303030 | 31313130 | 292e0a62 | 69747328 |
| 1111520 | 3130322c | 20322730 | 31303030 | 30303031 | 31313129 | 2e0a6269 | 74732831 | 30332c20 | 32273031 | 30303030 | 30313030 | 3030292e |
| 1111600 | 0a626974 | 73283130 | 342c2032 | 27303130 | 30303030 | 31303030 | 31292e0a | 62697473 | 28313035 | 2c203227 | 30313030 | 30303031 |
| 1111660 | 30303130 | 292e0a62 | 69747328 | 3130362c | 20322730 | 31303030 | 30303130 | 30313129 | 2e0a6269 | 74732831 | 30372c20 | 32273031 |
| 1111740 | 30303030 | 30313031 | 3030292e | 0a626974 | 73283130 | 382c2032 | 27303130 | 30303030 | 31303130 | 31292e0a | 62697473 | 28313039 |
| 1112020 | 2c203227 | 30313030 | 30303031 | 30313130 | 292e0a62 | 69747328 | 3131302c | 20322730 | 31303030 | 30303130 | 31313129 | 2e0a6269 |
| 1112100 | 74732831 | 31312c20 | 32273031 | 30303030 | 30313130 | 3030292e | 0a626974 | 73283131 | 322c2032 | 27303130 | 30303030 | 31313030 |
| 1112160 | 31292e0a | 62697473 | 28313133 | 2c203227 | 30313030 | 30303031 | 31303130 | 292e0a62 | 69747328 | 3131342c | 20322730 | 31303030 |
| 1112240 | 30303131 | 30313129 | 2e0a6269 | 74732831 | 31352c20 | 32273031 | 30303030 | 30313131 | 3030292e | 0a626974 | 73283131 | 362c2032 |
| 1112320 | 27303130 | 30303030 | 31313130 | 31292e0a | 62697473 | 28313137 | 2c203227 | 30313030 | 30303031 | 31313130 | 292e0a62 | 69747328 |
| 1112400 | 3131382c | 20322730 | 31303030 | 30303131 | 31313129 | 2e0a6269 | 74732831 | 31392c20 | 32273031 | 30303030 | 31303030 | 3030292e |
| 1112460 | 0a626974 | 73283132 | 302c2032 | 27303130 | 30303031 | 30303030 | 31292e0a | 62697473 | 28313231 | 2c203227 | 30313030 | 30303130 |
| 1112540 | 30303130 | 292e0a62 | 69747328 | 3132322c | 20322730 | 31303030 | 30313030 | 30313129 | 2e0a6269 | 74732831 | 32332c20 | 32273030 |
| 1112620 | 30303030 | 31313131 | 3131292e | 0a626974 | 73283132 | 342c2032 | 27303030 | 30303031 | 31313131 | 31292e0a | 62697473 | 28313235 |
| 1112700 | 2c203227 | 30303030 | 30303131 | 31313131 | 292e0a62 | 69747328 | 3132362c | 20322730 | 30303030 | 30313131 | 31313129 | 2e0a6269 |
| 1112760 | 74732831 | 32372c20 | 32273030 | 30303031 | 31313131 | 3131292e | 0a626974 | 73283132 | 382c2032 | 27303030 | 30303131 | 31313131 |
| 1113040 | 31292e0a | 62697473 | 28313239 | 2c203227 | 30303030 | 30313131 | 31313131 | 292e0a62 | 69747328 | 3133302c | 20322730 | 30303030 |
| 1113120 | 31313131 | 31313129 | 2e0a6269 | 74732831 | 33312c20 | 32273030 | 30303031 | 31313131 | 3131292e | 0a626974 | 73283133 | 322c2032 |
| 1113200 | 27303030 | 30303131 | 31313131 | 31292e0a | 62697473 | 28313333 | 2c203227 | 30303030 | 30313131 | 31313131 | 292e0a62 | 69747328 |

```
1113260  3133342c 20322730 30303030 31313131 31313129 2e0a6269 74732831 33352c20 32273030 30303031 31313131 3131292e
1113340  0a626974 73283133 362c2032 27303030 30303131 31313131 31292e0a 62697473 28313337 2c203227 30303030 30313131
1113420  31313131 292e0a62 69747328 3133382c 20322730 30303030 31313131 31313129 2e0a6269 74732831 33392c20 32273030
1113500  30303031 31313131 3131292e 0a626974 73283134 302c2032 27303030 30303131 31313131 31292e0a 62697473 28313431
1113560  2c203227 30303030 30313131 31313131 292e0a62 69747328 3134322c 20322730 30303030 31313131 31313129 2e0a6269
1113640  74732831 34332c20 32273030 30303031 31313131 3131292e 0a626974 73283134 342c2032 27303030 30303131 31313131
1113720  31292e0a 62697473 28313435 2c203227 30303030 30313131 31313131 292e0a62 69747328 3134362c 20322730 30303030
1114000  31313131 31313129 2e0a6269 74732831 34372c20 32273030 30303031 31313131 3131292e 0a626974 73283134 382c2032
1114060  27303030 30303131 31313131 31292e0a 62697473 28313439 2c203227 30303030 30313131 31313131 292e0a62 69747328
1114140  3135302c 20322730 30303030 31313131 31313129 2e0a6269 74732831 35312c20 32273030 30303031 31313131 3131292e
1114220  0a626974 73283135 322c2032 27303030 30303131 31313131 31292e0a 62697473 28313533 2c203227 30303030 30313131
1114300  31313131 292e0a62 69747328 3135342c 20322730 30303030 31313131 31313129 2e0a6269 74732831 35352c20 32273030
1114360  30303031 31313131 3131292e 0a626974 73283135 362c2032 27303030 30303131 31313131 31292e0a 62697473 28313537
1114440  2c203227 30303030 30313131 31313131 292e0a62 69747328 3135382c 20322730 30303030 31313131 31313129 2e0a6269
1114520  74732831 35392c20 32273030 30303031 31313131 3131292e 0a626974 73283136 302c2032 27303030 30303131 31313131
1114600  31292e0a 62697473 28313631 2c203227 30303030 30303131 31313131 292e0a62 69747328 3136322c 20322730 30303030
1114660  30313131 31313129 2e0a6269 74732831 36332c20 32273030 30303030 31313131 3131292e 0a626974 73283136 342c2032
1114740  27303030 30303031 31313131 31292e0a 62697473 28313635 2c203227 30303030 30303131 31313131 292e0a62 69747328
1115020  3136362c 20322730 30303030 30313131 31313129 2e0a6269 74732831 36372c20 32273030 30303030 31313131 3131292e
1115100  0a626974 73283136 382c2032 27303030 30303031 31313131 31292e0a 62697473 28313639 2c203227 30303030 30303131
1115160  31313131 292e0a62 69747328 3137302c 20322730 30303030 30313131 31313129 2e0a6269 74732831 37312c20 32273030
1115240  30303030 31313131 3131292e 0a626974 73283137 322c2032 27303030 30303031 31313131 31292e0a 62697473 28313733
1115320  2c203227 30303030 30303131 31313131 292e0a62 69747328 3137342c 20322730 30303030 30313131 31313129 2e0a6269
1115400  74732831 37352c20 32273030 30303030 31313131 3131292e 0a626974 73283137 362c2032 27303030 30303031 31313131
1115460  31292e0a 62697473 28313737 2c203227 30303030 30303131 31313131 292e0a62 69747328 3137382c 20322730 30303030
1115540  30313131 31313129 2e0a6269 74732831 37392c20 32273030 30303030 31313131 3131292e 0a626974 73283138 302c2032
1115620  27303030 30303031 31313131 31292e0a 62697473 28313831 2c203227 30303030 30303131 31313131 292e0a62 69747328
1115700  3138322c 20322730 30303030 30313131 31313129 2e0a6269 74732831 38332c20 32273030 30303030 31313131 3131292e
1115760  0a626974 73283138 342c2032 27303030 30303031 31313131 31292e0a 62697473 28313835 2c203227 30303030 30303131
1116040  31313131 292e0a62 69747328 3138362c 20322730 30303030 30313131 31313129 2e0a6269 74732831 38372c20 32273030
1116120  30303030 31313131 3131292e 0a626974 73283138 382c2032 27303030 30303031 31313131 31292e0a 62697473 28313839
1116200  2c203227 30303030 30303131 31313131 292e0a62 69747328 3139302c 20322730 30303030 30313131 31313129 2e0a6269
1116260  74732831 39312c20 32273030 30303030 31313131 3131292e 0a626974 73283139 322c2032 27303031 30303031 31313131
1116340  31292e0a 62697473 28313933 2c203227 30303130 30303131 31313131 292e0a62 69747328 3139342c 20322730 30313030
1116420  30313131 31313129 2e0a6269 74732831 39352c20 32273030 31303030 31313131 3131292e 0a626974 73283139 362c2032
1116500  27303031 30303031 31313131 31292e0a 62697473 28313937 2c203227 30303130 30303131 31313131 292e0a62 69747328
1116560  3139382c 20322730 30313030 30313131 31313129 2e0a6269 74732831 39392c20 32273030 31303030 31313131 3131292e
1116640  0a626974 73283230 302c2032 27303031 30303031 31313131 31292e0a 62697473 28323031 2c203227 30303130 30303131
1116720  31313131 292e0a62 69747328 3230322c 20322730 30313030 30313131 31313129 2e0a6269 74732832 30332c20 32273030
1117000  31303030 31313131 3131292e 0a626974 73283230 342c2032 27303031 30303031 31313131 31292e0a 62697473 28323035
1117060  2c203227 30303130 30303131 31313131 292e0a62 69747328 3230362c 20322730 30313030 30313131 31313129 2e0a6269
1117140  74732832 30372c20 32273030 31303030 31313131 3131292e 0a626974 73283230 382c2032 27303031 30303031 31313131
1117220  31292e0a 62697473 28323039 2c203227 30303130 30303131 31313131 292e0a62 69747328 3231302c 20322730 30313030
1117300  30313131 31313129 2e0a6269 74732832 31312c20 32273030 31303030 31313131 3131292e 0a626974 73283231 322c2032
1117360  27303031 30303031 31313131 31292e0a 62697473 28323133 2c203227 30303130 30303131 31313131 292e0a62 69747328
1117440  3231342c 20322730 30313030 30313131 31313129 2e0a6269 74732832 31352c20 32273030 31303030 31313131 3131292e
1117520  0a626974 73283231 362c2032 27303031 30303031 31313131 31292e0a 62697473 28323137 2c203227 30303130 30303131
1117600  31313131 292e0a62 69747328 3231382c 20322730 30313030 30313131 31313129 2e0a6269 74732832 31392c20 32273030
1117660  31303030 31313131 3131292e 0a626974 73283232 302c2032 27303031 30303031 31313131 31292e0a 62697473 28323231
1117740  2c203227 30303130 30303131 31313131 292e0a62 69747328 3232322c 20322730 30313030 30313131 31313129 2e0a6269
1120020  74732832 32332c20 32273130 00086973 5f637379 6d66006c 00086973 5f677261 7068002d 00096973 5f6c6179 6f757400
1120100  00086973 5f6c6f77 657200c0 00086973 5f706172 656e00cc 00096973 5f706572 696f6400 00086973 5f707269 6e7400e4
1120160  00086973 5f70756e 6374009f 00086973 5f71756f 74650057 00086973 5f737061 63650041 00086973 5f757070 657200f9
1120240  00086973 5f776869 74650029 0008746f 5f757070 65720057 000956bc 00000000 000b96d8 000bd630 00094f7c 00000000
1120320  000b80e0 000bd640 00094f8c 00000000 000b80b0 000bd650 000b8068 00094c00 000b8010 00094eac b4640007 0009d64c
```

| | | | | | | | | | | | | |
|---|---|---|---|---|---|---|---|---|---|---|---|---|
| 1120400 | 000bd67c | b4642aff | 0009d8e0 | C0000000 | 0008055c | 010038b7 | 00003867 | 00000004 | 000bdc9c | 000bdc9c | 00010049 | 00000000 |
| 1120460 | 00094fdc | 00000000 | 000b7f24 | 000bd6a8 | 0008057c | 010038bf | 00003867 | 00000004 | 0009d214 | 0009d214 | 00010049 | 00000000 |
| 1120540 | 000b7ee8 | 00094eb4 | 0008059c | 010038c7 | 00003867 | 00000004 | 000bdce0 | 000bdce0 | 00010049 | 00000000 | 000b7e54 | 00094ec4 |
| 1120620 | 000805bc | 010038cf | 00003867 | 00000004 | 000bdd18 | 000bdd18 | 00010049 | 00000000 | 0009501c | 00000000 | 000b7dc4 | 000bd728 |
| 1120700 | 0007e4fc | 010038d7 | 00003867 | 00000004 | 000bdd50 | 000bdd50 | 00010049 | 00000000 | 0009502c | 00000000 | 000b7d64 | 000bd758 |
| 1120760 | 0007e51c | 010038df | 00003867 | 00000004 | 000bdd9c | 000bdd9c | 00010049 | 00000000 | 0009503c | 00000000 | 000b7d0c | 000bd788 |
| 1121040 | 0007e53c | 010038e7 | 00003867 | 00000004 | 000bdde8 | 000bdde8 | 00010049 | 00000000 | 0009504c | 00000000 | 000b7c5c | 000bd7b8 |
| 1121120 | 0007e55c | 020038ef | 00003867 | 00000008 | 000bde20 | 000bde20 | 00010049 | 00000000 | 0009505c | 00000000 | 000b7bbc | 000bd7e8 |
| 1121200 | 0007e57c | 010038f7 | 00003867 | 00000004 | 000bde78 | 000bde78 | 00010049 | 00000000 | 0009506c | 00000000 | 000b7b68 | 000bd818 |
| 1121260 | 000805fc | 010038ff | 00003867 | 00000004 | 000bdee8 | 000bdee8 | 00010049 | 00000000 | 000b7afc | 00094c20 | ffffffff | 01003907 |
| 1121340 | 00003867 | 00000004 | 000bdf20 | 000bdf20 | 00010049 | 00000000 | ffffffff | 0100390f | 00003867 | 00000004 | 000bdf6c | 000bdf6c |
| 1121420 | 00010049 | 00000000 | 0007e59c | 01003917 | 00003867 | 00000004 | 000bdfd8 | 000bdfd8 | 00010049 | 00000000 | 0007e5bc | 0100391f |
| 1121500 | 00003867 | 00000004 | 000be018 | 000be018 | 00010049 | 00000000 | 0009496c | 00000000 | 000b7674 | 000bd8d0 | 0008063c | 01003927 |
| 1121560 | 00003867 | 00000004 | 000be074 | 000be074 | 00010049 | 00000000 | 0009508c | 00000000 | 000b7634 | 000bd900 | 000b7a8c | 0200360f |
| 1121640 | 00003867 | 00000008 | 0009e3e0 | 0009e3e0 | 00010049 | 00000000 | 000956ac | 00000000 | 0009d320 | 000bd930 | 0009a450 | 0200392f |
| 1121720 | 00003867 | 00000008 | 0009e448 | 0009e448 | 00010049 | 00000000 | 001d2240 | 28232938 | 392f3038 | 2f323820 | 63747970 | 65732e70 |
| 1122000 | 6c093333 | 2e312200 | 000a1564 | 0100319f | 00003867 | 00000004 | 000bd9f8 | 000bd9f8 | 00010049 | 00000000 | 000a6173 | 73657274 |
| 1122060 | 6f6e6c79 | 00000000 | 00000028 | 000a1600 | b27cb66c | 00000157 | 7fffffff | 000c20e4 | 02000ce5 | 01002c35 | 00003867 | 00002aff |
| 1122140 | 00003867 | b328d9e2 | 000bd9bc | 00000000 | 010047df | b328de54 | 000f165c | 00000000 | 2cac039b | 0002438a | 2ca0032b | 00000000 |
| 1122220 | 00000001 | 0009d8b4 | 0009d8b4 | 0002438a | 000b1a1c | 0009d8c0 | 00046269 | 7473002a | 000a6173 | 73657274 | 696f6e73 | 00000000 |
| 1122300 | 000ca2a0 | 00000000 | 2c780026 | 0002438a | 25203310 | 24d00000 | 000bda78 | 0010aa18 | aab40f00 | 9f24aab4 | 0000a260 | 22a0da6a |
| 1122360 | 000806bc | 0200393f | 00003867 | 00000008 | 000be170 | 000be170 | 00010049 | 00000000 | 00003a2f | b3280007 | 000b0d08 | 00000000 |
| 1122440 | 2c780010 | 0002438a | 239c0000 | 000c2068 | 000b85f0 | 000bdc30 | 2c780026 | 0002438a | 25203310 | 24d00000 | 000bda78 | 0010aa18 |
| 1122520 | aab40e00 | 9f24aab4 | 0000a260 | 22a0236f | 00003a97 | b3287614 | 0009f074 | 00000000 | 2c780020 | 0002438a | 42680000 | 000003fb |
| 1122600 | 42540000 | 00000003 | 239c0000 | 000bdb18 | ffffffff | 030034cf | 00003867 | 0000000c | 0009e4b0 | 0009e4b0 | 00010049 | 00000000 |
| 1122660 | 2c780010 | 0002438a | 239c0000 | 000c2088 | 0007e5fc | 03003947 | 00003867 | 0000000c | 000be120 | 000be12c | 00010049 | 00000000 |
| 1122740 | 2c780020 | 0002438a | 42680000 | 000007fb | 42540000 | 00000003 | 239c0000 | 000bdb18 | 00036c69 | 74000008 | 2c780026 | 0002438a |
| 1123020 | 25203310 | 24d00000 | 000bda78 | 0010aa18 | aab40040 | 9f24aab4 | 0000a260 | 22a000b3 | 2c780010 | 0002438a | 239c0000 | 000c2048 |
| 1123100 | 2c780026 | 0002438a | 25203310 | 24d00000 | 000bda78 | 0010aa18 | aab41f00 | 9f24aab4 | 0000a260 | 22a00363 | 2c780010 | 0002438a |
| 1123160 | 239c0000 | 000c2028 | 2c780026 | 0002438a | 25203310 | 24d00000 | 000bda78 | 0010aa18 | aab41e00 | 9f24aab4 | 0000a260 | 22a0032b |
| 1123240 | 2c780010 | 0002438a | 239c0000 | 000c2008 | 000b8ce8 | 00000000 | 000b8b74 | 000bdc28 | 2c780026 | 0002438a | 25203310 | 24d00000 |
| 1123320 | 000bda78 | 0010aa18 | aab40100 | 9f24aab4 | 0000a260 | 22a0017b | 2b24feac | 0002438a | 000c8144 | b464feb8 | 000c7f3c | 000bfeb4 |
| 1123400 | 2c780010 | 0002438a | 239c0000 | 000c1fe8 | 2c780012 | 0002438a | 4e1c0000 | fffffffb | 228cdc9e | 2cac036b | 0002438a | 2ca0030b |
| 1123460 | 00000000 | 00000001 | 000bdc88 | 000bdc88 | 0002438a | 0009cbe4 | 2c780010 | 0002438a | 239c0000 | 000c1fc8 | 000039c7 | b328cbe8 |
| 1123540 | 000aabd8 | 00000000 | 2c780026 | 0002438a | 25203310 | 24d00000 | 000bda78 | 0010aa18 | aab400c0 | 9f24aab4 | 0000a168 | 22a0017b |
| 1123620 | 00003a97 | b328dd78 | 000c4544 | 00000000 | 2c780026 | 0002438a | 25203310 | 24d00000 | 000bda78 | 0010aa18 | aab400c0 | 9f24aab4 |
| 1123700 | 0000a260 | 22a0036b | 000d7669 | 7369626c | 655f756e | 69747300 | 2c780026 | 0002438a | 25203310 | 24d00000 | 000bda78 | 0010aa18 |
| 1123760 | aab40400 | 9f24aab4 | 0000a260 | 22a0018b | 000039c7 | b328e059 | 000b964c | 00000000 | 2c780012 | 0002438a | 4e1c0000 | 00000053 |
| 1124040 | 228cdd9e | 2cac0393 | 0002438a | 2ca0032b | 00000000 | 00000001 | 000bdd88 | 000bdd88 | 0002438a | 000bddc0 | 000bdd94 | 000b6269 |
| 1124120 | 67737461 | 72742e70 | 6c000000 | 2c780012 | 0002438a | 4e1c0000 | 00000063 | 228c03a3 | 2cacddee | 0002438a | 2ca0ddf6 | 00000000 |
| 1124200 | 00000001 | 000bdd4 | 000bddd4 | 0002438a | 000bde0c | 000bdde0 | 000d496c | 6c656761 | 6c206261 | 73652000 | 2cacde26 | 0002438a |
| 1124260 | 2ca0de2e | 0000000c | 00000004 | 000b9080 | 000b85e4 | 0002438a | 000bde44 | 000b908c | 00000000 | 000bdaa9 | 0000386f | |
| 1124340 | b328de5e | 000c20e8 | 00000000 | 27f00012 | 000bdea0 | 4e1c0000 | 00000173 | 228c032b | 2cacde7e | 0002438a | 2ca0de86 | 0000000c |
| 1124420 | 00000003 | 000bde64 | 000bdeb4 | 0002438a | 000bdec8 | 000c21c0 | 28c40012 | 000bdeb4 | 4e1c0000 | 000001fb | 228cdeb6 | 29540012 |
| 1124500 | 0002438a | 4e1c0000 | 0000010b | 228c039b | 00000000 | 000bdec0 | 000bde70 | 000bdeac | 0009cb5c | 00000010 | 000c673c | 00000000 |
| 1124560 | 2c780026 | 0002438a | 25203310 | 24d00000 | 000b1a78 | 0010aa18 | aab40040 | 9f24aab4 | 0000a168 | 22a00373 | 000a6765 | 745f6c69 |
| 1124640 | 6e655f31 | 00000000 | 2c780026 | 0002438a | 25203310 | 24d00000 | 000bda78 | 0010aa18 | aab407c0 | 9f24aab4 | 0000a168 | 22a0032b |
| 1124720 | 00003987 | b328031b | 000bb8e4 | 00000000 | 27f00012 | 000bdf90 | 4e1c0000 | 0000013b | 228cdf6e | 2cac0363 | 0002438a | 2ca0032b |
| 1125000 | 0000000c | 00000003 | 000bdf58 | 000bdfa4 | 0002438a | 000bdfb8 | 28c40012 | 000bdfa4 | 4e1c0000 | 00000113 | 228c0007 | 29540012 |
| 1125060 | 0002438a | 4e1c0000 | 00000303 | 228c0363 | 000bdfb0 | 00000000 | 000bdf9c | 000bdf64 | 0000397f | b3280343 | 000bb8b0 | 00000000 |
| 1125140 | 2c780026 | 0002438a | 25203310 | 24d00000 | 000bda78 | 0010aa18 | aab40080 | 9f24aab4 | 0000a260 | 22a0039b | 00003977 | b328030b |
| 1125220 | 000bb87c | 00000000 | 00056d61 | 74636800 | 2c780026 | 0002438a | 25203310 | 24d00000 | 000bda78 | 0010aa18 | aab40200 | 9f24aab4 |
| 1125300 | 0000a260 | 22a00393 | 0000396f | b464032b | 000bb7e0 | 000bff44 | 00027673 | 000c87b0 | 000be110 | 00000000 | 27f00012 | 000be098 |
| 1125360 | 4e1c0000 | 00000103 | 228ce066 | 2cac030b | 0002438a | 2ca00373 | 00000004 | 00000002 | 000be060 | 000be098 | 0002438a | 000be0ac |
| 1125440 | 29540012 | 0002438a | 4e1c0000 | 0000004b | 228ce09e | 000be06c | 000be0a4 | 0000386f | b3280000 | 000bb780 | 00000000 | 000be148 |

```
1125520  00000000 000e8fbc 000e5154 00003967 b464e0ce 000bb7ac 000bff50 00067261 6e676531 000003c3 0009cedd 000be0b4
1125600  00000000 00000000 00037265 6c000000 000b4fc8 000b2ca0 0000395f b328017b 000bb714 00000000 27f0000c 000be12c
1125660  4950228c 2954001c 0002438a a958aaf0 0001ac08 a858a874 a53822bc 000bdb49 0000395f b328039b 000bb690 00000000
1125740  27f00018 000be194 4e1c0000 00000003 52c40000 000003fb 2cace176 0002438a 2ca0e17c 000003fc 00000100 000be158
1126020  000bf99c 0002438a 0009f4c4 28c40018 000be1b4 4e1c0000 0000000b 52c40000 000003fb 000b8a64 000b2ccc 28c40018
1126100  000be1dc 4e1c0000 00000013 52c40000 000003fb 2c780010 0002438a 239c0000 000b9358 28c40018 000be1f4 4e1c0000
1126160  0000001b 52c40000 000003fb 28c40018 000be22c 4e1c0000 00000023 52c40000 000003fb 000b9348 01003887 00002c07
1126240  00000004 000be1cc 000be1cc 00410000 00000000 28c40018 000be244 4e1c0000 0000002b 52c40000 000003fb 28c40018
1126320  000be25c 4e1c0000 00000033 52c40000 000003fb 28c40018 000be274 4e1c0000 0000003b 52c40000 000003fb 28c40018
1126400  000be28c 4e1c0000 00000043 52c40000 000003fb 28c40018 000be2a4 4e1c0000 0000004b 52c40000 000007fb 28c40018
1126460  000be2bc 4e1c0000 00000053 52c40000 000007fb 28c40018 000be2d4 4e1c0000 0000005b 52c40000 000007fb 28c40018
1126540  000be2ec 4e1c0000 00000063 52c40000 000007fb 28c40018 000be304 4e1c0000 0000006b 52c40000 000007fb 28c40018
1126620  000be31c 4e1c0000 00000073 52c40000 000003fb 28c40018 000be334 4e1c0000 0000007b 52c40000 000003fb 28c40018
1126700  000be34c 4e1c0000 00000083 52c40000 000003fb 28c40018 000be364 4e1c0000 0000008b 52c40000 000003fb 28c40018
1126760  000be37c 4e1c0000 00000093 52c40000 000003fb 28c40018 000be394 4e1c0000 0000009b 52c40000 000003fb 28c40018
1127040  000be3ac 4e1c0000 000000a3 52c40000 000003fb 28c40018 000be3c4 4e1c0000 000000ab 52c40000 000003fb 28c40018
1127120  000be3dc 4e1c0000 000000b3 52c40000 000003fb 28c40018 000be3f4 4e1c0000 000000bb 52c40000 000003fb 28c40018
1127200  000be40c 4e1c0000 000000c3 52c40000 000003fb 28c40018 000be424 4e1c0000 000000cb 52c40000 000003fb 28c40018
1127260  000be43c 4e1c0000 000000d3 52c40000 000003fb 28c40018 000be454 4e1c0000 000000db 52c40000 000003fb 28c40018
1127340  000be46c 4e1c0000 000000e3 52c40000 000003fb 28c40018 000be484 4e1c0000 000000eb 52c40000 000003fb 28c40018
1127420  000be49c 4e1c0000 000000f3 52c40000 000003fb 28c40018 000be4b4 4e1c0000 000000fb 52c40000 000007fb 28c40018
1127500  000be4cc 4e1c0000 00000103 52c40000 000005fb 28c40018 000be4e4 4e1c0000 0000010b 52c40000 000001fb 28c40018
1127560  000be4fc 4e1c0000 00000113 52c40000 000001fb 28c40018 000be514 4e1c0000 0000011b 52c40000 000001fb 28c40018
1127640  000be52c 4e1c0000 00000123 52c40000 000001fb 28c40018 000be544 4e1c0000 0000012b 52c40000 000001fb 28c40018
1127720  000be55c 4e1c0000 00000133 52c40000 000001fb 28c40018 000be574 4e1c0000 0000013b 52c40000 000001fb 28c40018
1130000  000be58c 4e1c0000 00000143 52c40000 000001fb 28c40018 000be5a4 4e1c0000 0000014b 52c40000 000001fb 28c40018
1130060  000be5bc 4e1c0000 00000153 52c40000 000001fb 28c40018 000be5d4 4e1c0000 0000015b 52c40000 000001fb 28c40018
1130140  000be5ec 4e1c0000 00000163 52c40000 000001fb 28c40018 000be604 4e1c0000 0000016b 52c40000 000001fb 28c40018
1130220  000be61c 4e1c0000 00000173 52c40000 000001fb 28c40018 000be634 4e1c0000 0000017b 52c40000 000001fb 28c40018
1130300  000be64c 4e1c0000 00000183 52c40000 00000803 28c40018 000be664 4e1c0000 0000018b 52c40000 0000080b 28c40018
1130360  000be67c 4e1c0000 00000193 52c40000 00000813 28c40018 000be694 4e1c0000 0000019b 52c40000 0000081b 28c40018
1130440  000be6ac 4e1c0000 000001a3 52c40000 00000823 28c40018 000be6c4 4e1c0000 000001ab 52c40000 0000082b 28c40018
1130520  000be6dc 4e1c0000 000001b3 52c40000 00000833 28c40018 000be6f4 4e1c0000 000001bb 52c40000 0000083b 28c40018
1130600  000be70c 4e1c0000 000001c3 52c40000 00000843 28c40018 000be724 4e1c0000 000001cb 52c40000 0000084b 28c40018
1130660  000be73c 4e1c0000 000001d3 52c40000 000001fb 28c40018 000be754 4e1c0000 000001db 52c40000 000001fb 28c40018
1130740  000be76c 4e1c0000 000001e3 52c40000 000001fb 28c40018 000be784 4e1c0000 000001eb 52c40000 000001fb 28c40018
1131020  000be79c 4e1c0000 000001f3 52c40000 000001fb 28c40018 000be7b4 4e1c0000 000001fb 52c40000 000001fb 28c40018
1131100  000be7cc 4e1c0000 00000203 52c40000 000001fb 28c40018 000be7e4 4e1c0000 0000020b 52c40000 00001053 28c40018
1131160  000be7fc 4e1c0000 00000213 52c40000 0000105b 28c40018 000be814 4e1c0000 0000021b 52c40000 00001063 28c40018
1131240  000be82c 4e1c0000 00000223 52c40000 0000106b 28c40018 000be844 4e1c0000 0000022b 52c40000 00001073 28c40018
1131320  000be85c 4e1c0000 00000233 52c40000 0000107b 28c40018 000be874 4e1c0000 0000023b 52c40000 00001083 28c40018
1131400  000be88c 4e1c0000 00000243 52c40000 0000108b 28c40018 000be8a4 4e1c0000 0000024b 52c40000 00001093 28c40018
1131460  000be8bc 4e1c0000 00000253 52c40000 0000109b 28c40018 000be8d4 4e1c0000 0000025b 52c40000 000010a3 28c40018
1131540  000be8ec 4e1c0000 00000263 52c40000 000010ab 28c40018 000be904 4e1c0000 0000026b 52c40000 000010b3 28c40018
1131620  000be91c 4e1c0000 00000273 52c40000 000010bb 28c40018 000be934 4e1c0000 0000027b 52c40000 000010c3 28c40018
1131700  000be94c 4e1c0000 00000283 52c40000 000010cb 28c40018 000be964 4e1c0000 0000028b 52c40000 000010d3 28c40018
1131760  000be97c 4e1c0000 00000293 52c40000 000010db 28c40018 000be994 4e1c0000 0000029b 52c40000 000010e3 28c40018
1132040  000be9ac 4e1c0000 000002a3 52c40000 000010eb 28c40018 000be9c4 4e1c0000 000002ab 52c40000 000010f3 28c40018
1132120  000be9dc 4e1c0000 000002b3 52c40000 000010fb 28c40018 000be9f4 4e1c0000 000002bb 52c40000 00001103 28c40018
1132200  000bea0c 4e1c0000 000002c3 52c40000 0000110b 28c40018 000bea24 4e1c0000 000002cb 52c40000 00001113 28c40018
1132260  000bea3c 4e1c0000 000002d3 52c40000 0000111b 28c40018 000bea54 4e1c0000 000002db 52c40000 000001fb 28c40018
1132340  000bea6c 4e1c0000 000002e3 52c40000 000001fb 28c40018 000bea84 4e1c0000 000002eb 52c40000 000001fb 28c40018
1132420  000bea9c 4e1c0000 000002f3 52c40000 000001fb 28c40018 000beab4 4e1c0000 000002fb 52c40000 000081fb 28c40018
1132500  000beacc 4e1c0000 00000303 52c40000 000001fb 28c40018 000beae4 4e1c0000 0000030b 52c40000 00002053 28c40018
1132560  000beafc 4e1c0000 00000313 52c40000 0000205b 28c40018 000beb14 4e1c0000 0000031b 52c40000 00002063 28c40018
```

```
1132640  000beb2c 4e1c0000 00000323 52c40000 0000206b 28c40018 000beb44 4e1c0000 0000032b 52c40000 00002073 28c40018
1132720  000beb5c 4e1c0000 00000333 52c40000 0000207b 28c40018 000beb74 4e1c0000 0000033b 52c40000 00002083 28c40018
1133000  000beb8c 4e1c0000 00000343 52c40000 0000208b 28c40018 000beba4 4e1c0000 0000034b 52c40000 00002093 28c40018
1133060  000bebbc 4e1c0000 00000353 52c40000 0000209b 28c40018 000bebd4 4e1c0000 0000035b 52c40000 000020a3 28c40018
1133140  000bebec 4e1c0000 00000363 52c40000 000020ab 28c40018 000bec04 4e1c0000 0000036b 52c40000 000020b3 28c40018
1133220  000bec1c 4e1c0000 00000373 52c40000 000020bb 28c40018 000bec34 4e1c0000 0000037b 52c40000 000020c3 28c40018
1133300  000bec4c 4e1c0000 00000383 52c40000 000020cb 28c40018 000bec64 4e1c0000 0000038b 52c40000 000020d3 28c40018
1133360  000bec7c 4e1c0000 00000393 52c40000 000020db 28c40018 000bec94 4e1c0000 0000039b 52c40000 000020e3 28c40018
1133440  000becac 4e1c0000 000003a3 52c40000 000020eb 28c40018 000becc4 4e1c0000 000003ab 52c40000 000020f3 28c40018
1133520  000becdc 4e1c0000 000003b3 52c40000 000020fb 28c40018 000becf4 4e1c0000 000003bb 52c40000 00002103 28c40018
1133600  000bed0c 4e1c0000 000003c3 52c40000 0000210b 28c40018 000bed24 4e1c0000 000003cb 52c40000 00002113 28c40018
1133660  000bed3c 4e1c0000 000003d3 52c40000 0000211b 28c40018 000bed54 4e1c0000 000003db 52c40000 000001fb 28c40018
1133740  000bed6c 4e1c0000 000003e3 52c40000 000001fb 28c40018 000bed84 4e1c0000 000003eb 52c40000 000001fb 28c40018
1134020  000bed9c 4e1c0000 000003f3 52c40000 000001fb 28c40018 000bedb4 4e1c0000 000003fb 52c40000 000003fb 28c40018
1134100  000bedcc 4e1c0000 00000403 52c40000 000003fb 28c40018 000bede4 4e1c0000 0000040b 52c40000 000003fb 28c40018
1134160  000bedfc 4e1c0000 00000413 52c40000 000003fb 28c40018 000bee14 4e1c0000 0000041b 52c40000 000003fb 28c40018
1134240  000bee2c 4e1c0000 00000423 52c40000 000003fb 28c40018 000bee44 4e1c0000 0000042b 52c40000 000003fb 28c40018
1134320  000bee5c 4e1c0000 00000433 52c40000 000003fb 28c40018 000bee74 4e1c0000 0000043b 52c40000 000003fb 28c40018
1134400  000bee8c 4e1c0000 00000443 52c40000 000003fb 28c40018 000beea4 4e1c0000 0000044b 52c40000 000003fb 28c40018
1134460  000beebc 4e1c0000 00000453 52c40000 000003fb 28c40018 000beed4 4e1c0000 0000045b 52c40000 000003fb 28c40018
1134540  000beeec 4e1c0000 00000463 52c40000 000003fb 28c40018 000bef04 4e1c0000 0000046b 52c40000 000003fb 28c40018
1134620  000bef1c 4e1c0000 00000473 52c40000 000003fb 28c40018 000bef34 4e1c0000 0000047b 52c40000 000003fb 28c40018
1134700  000bef4c 4e1c0000 00000483 52c40000 000003fb 28c40018 000bef64 4e1c0000 0000048b 52c40000 000003fb 28c40018
1134760  000bef7c 4e1c0000 00000493 52c40000 000003fb 28c40018 000bef94 4e1c0000 0000049b 52c40000 000003fb 28c40018
1135040  000befac 4e1c0000 000004a3 52c40000 000003fb 28c40018 000befc4 4e1c0000 000004ab 52c40000 000003fb 28c40018
1135120  000befdc 4e1c0000 000004b3 52c40000 000003fb 28c40018 000beff4 4e1c0000 000004bb 52c40000 000003fb 28c40018
1135200  000bf00c 4e1c0000 000004c3 52c40000 000003fb 28c40018 000bf024 4e1c0000 000004cb 52c40000 000003fb 28c40018
1135260  000bf03c 4e1c0000 000004d3 52c40000 000003fb 28c40018 000bf054 4e1c0000 000004db 52c40000 000003fb 28c40018
1135340  000bf06c 4e1c0000 000004e3 52c40000 000003fb 28c40018 000bf084 4e1c0000 000004eb 52c40000 000003fb 28c40018
1135420  000bf09c 4e1c0000 000004f3 52c40000 000003fb 28c40018 000bf0b4 4e1c0000 000004fb 52c40000 000003fb 28c40018
1135500  000bf0cc 4e1c0000 00000503 52c40000 000003fb 28c40018 000bf0e4 4e1c0000 0000050b 52c40000 000001fb 28c40018
1135560  000bf0fc 4e1c0000 00000513 52c40000 000001fb 28c40018 000bf114 4e1c0000 0000051b 52c40000 000001fb 28c40018
1135640  000bf12c 4e1c0000 00000523 52c40000 000001fb 28c40018 000bf144 4e1c0000 0000052b 52c40000 000001fb 28c40018
1135720  000bf15c 4e1c0000 00000533 52c40000 000001fb 28c40018 000bf174 4e1c0000 0000053b 52c40000 000001fb 28c40018
1136000  000bf18c 4e1c0000 00000543 52c40000 000001fb 28c40018 000bf1a4 4e1c0000 0000054b 52c40000 000001fb 28c40018
1136060  000bf1bc 4e1c0000 00000553 52c40000 000001fb 28c40018 000bf1d4 4e1c0000 0000055b 52c40000 000001fb 28c40018
1136140  000bf1ec 4e1c0000 00000563 52c40000 000001fb 28c40018 000bf204 4e1c0000 0000056b 52c40000 000001fb 28c40018
1136220  000bf21c 4e1c0000 00000573 52c40000 000001fb 28c40018 000bf234 4e1c0000 0000057b 52c40000 000001fb 28c40018
1136300  000bf24c 4e1c0000 00000583 52c40000 000001fb 28c40018 000bf264 4e1c0000 0000058b 52c40000 000001fb 28c40018
1136360  000bf27c 4e1c0000 00000593 52c40000 000001fb 28c40018 000bf294 4e1c0000 0000059b 52c40000 000001fb 28c40018
1136440  000bf2ac 4e1c0000 000005a3 52c40000 000001fb 28c40018 000bf2c4 4e1c0000 000005ab 52c40000 000001fb 28c40018
1136520  000bf2dc 4e1c0000 000005b3 52c40000 000001fb 28c40018 000bf2f4 4e1c0000 000005bb 52c40000 000001fb 28c40018
1136600  000bf30c 4e1c0000 000005c3 52c40000 000001fb 28c40018 000bf324 4e1c0000 000005cb 52c40000 000001fb 28c40018
1136660  000bf33c 4e1c0000 000005d3 52c40000 000001fb 28c40018 000bf354 4e1c0000 000005db 52c40000 000001fb 28c40018
1136740  000bf36c 4e1c0000 000005e3 52c40000 000001fb 28c40018 000bf384 4e1c0000 000005eb 52c40000 000001fb 28c40018
1137020  000bf39c 4e1c0000 000005f3 52c40000 000001fb 28c40018 000bf3b4 4e1c0000 000005fb 52c40000 000001fb 28c40018
1137100  000bf3cc 4e1c0000 00000603 52c40000 000011fb 28c40018 000bf3e4 4e1c0000 0000060b 52c40000 000011fb 28c40018
1137160  000bf3fc 4e1c0000 00000613 52c40000 000011fb 28c40018 000bf414 4e1c0000 0000061b 52c40000 000011fb 28c40018
1137240  000bf42c 4e1c0000 00000623 52c40000 000011fb 28c40018 000bf444 4e1c0000 0000062b 52c40000 000011fb 28c40018
1137320  000bf45c 4e1c0000 00000633 52c40000 000011fb 28c40018 000bf474 4e1c0000 0000063b 52c40000 000011fb 28c40018
1137400  000bf48c 4e1c0000 00000643 52c40000 000011fb 28c40018 000bf4a4 4e1c0000 0000064b 52c40000 000011fb 28c40018
1137460  000bf4bc 4e1c0000 00000653 52c40000 000011fb 28c40018 000bf4d4 4e1c0000 0000065b 52c40000 000011fb 28c40018
1137540  000bf4ec 4e1c0000 00000663 52c40000 000011fb 28c40018 000bf504 4e1c0000 0000066b 52c40000 000011fb 28c40018
1137620  000bf51c 4e1c0000 00000673 52c40000 000011fb 28c40018 000bf534 4e1c0000 0000067b 52c40000 000011fb 28c40018
1137700  000bf54c 4e1c0000 00000683 52c40000 000011fb 28c40018 000bf564 4e1c0000 0000068b 52c40000 000011fb 28c40018
```

```
1137760  000bf57c 4e1c0000 00000693 52c40000 000011fb 28c40018 000bf594 4e1c0000 0000069b 52c40000 000011fb 28c40018
1140040  000bf5ac 4e1c0000 000006a3 52c40000 000011fb 28c40018 000bf5c4 4e1c0000 000006ab 52c40000 000011fb 28c40018
1140120  000bf5dc 4e1c0000 000006b3 52c40000 000011fb 28c40018 000bf5f4 4e1c0000 000006bb 52c40000 000011fb 28c40018
1140200  000bf60c 4e1c0000 000006c3 52c40000 000011fb 28c40018 000bf624 4e1c0000 000006cb 52c40000 000011fb 28c40018
1140260  000bf63c 4e1c0000 000006d3 52c40000 000011fb 28c40018 000bf654 4e1c0000 000006db 52c40000 000011fb 28c40018
1140340  000bf66c 4e1c0000 000006e3 52c40000 000011fb 28c40018 000bf684 4e1c0000 000006eb 52c40000 000011fb 28c40018
1140420  000bf69c 4e1c0000 000006f3 52c40000 000011fb 28c40018 000bf6b4 4e1c0000 000006fb 52c40000 000041fb 28c40018
1140500  000bf6cc 4e1c0000 00000703 52c40000 000021fb 28c40018 000bf6e4 4e1c0000 0000070b 52c40000 000021fb 28c40018
1140560  000bf6fc 4e1c0000 00000713 52c40000 000021fb 28c40018 000bf714 4e1c0000 0000071b 52c40000 000021fb 28c40018
1140640  000bf72c 4e1c0000 00000723 52c40000 000021fb 28c40018 000bf744 4e1c0000 0000072b 52c40000 000021fb 28c40018
1140720  000bf75c 4e1c0000 00000733 52c40000 000021fb 28c40018 000bf774 4e1c0000 0000073b 52c40000 000021fb 28c40018
1141000  000bf78c 4e1c0000 00000743 52c40000 000021fb 28c40018 000bf7a4 4e1c0000 0000074b 52c40000 000021fb 28c40018
1141060  000bf7bc 4e1c0000 00000753 52c40000 000021fb 28c40018 000bf7d4 4e1c0000 0000075b 52c40000 000021fb 28c40018
1141140  000bf7ec 4e1c0000 00000763 52c40000 000021fb 28c40018 000bf804 4e1c0000 0000076b 52c40000 000021fb 28c40018
1141220  000bf81c 4e1c0000 00000773 52c40000 000021fb 28c40018 000bf834 4e1c0000 0000077b 52c40000 000021fb 28c40018
1141300  000bf84c 4e1c0000 00000783 52c40000 000021fb 28c40018 000bf864 4e1c0000 0000078b 52c40000 000021fb 28c40018
1141360  000bf87c 4e1c0000 00000793 52c40000 000021fb 28c40018 000bf894 4e1c0000 0000079b 52c40000 000021fb 28c40018
1141440  000bf8ac 4e1c0000 000007a3 52c40000 000021fb 28c40018 000bf8c4 4e1c0000 000007ab 52c40000 000021fb 28c40018
1141520  000bf8dc 4e1c0000 000007b3 52c40000 000021fb 28c40018 000bf8f4 4e1c0000 000007bb 52c40000 000021fb 28c40018
1141600  000bf90c 4e1c0000 000007c3 52c40000 000021fb 28c40018 000bf924 4e1c0000 000007cb 52c40000 000021fb 28c40018
1141660  000bf93c 4e1c0000 000007d3 52c40000 000021fb 28c40018 000bf954 4e1c0000 000007db 52c40000 000021fb 28c40018
1141740  000bf96c 4e1c0000 000007e3 52c40000 000021fb 28c40018 000bf984 4e1c0000 000007eb 52c40000 000021fb 28c40018
1142020  000bf99c 4e1c0000 000007f3 52c40000 000021fb 29540018 0002438a 4e1c0000 000007fb 52c40000 000041fb b464d560
1142100  0009d6c8 000bff20 27f00012 000c2234 4e1c0000 00000007 228c0000 0007666c 61747465 6e00fe60 2c780010 0002438a
1142160  239c0000 000b9168 000b8e00 0100388f 00002c07 00000004 000bfa10 000bfa10 00410000 00000000 2c780010 0002438a
1142240  239c0000 000b8e10 000b8c1c 01003897 00002c07 00000004 000bfa40 000bfa40 00410000 00000000 2c780010 0002438a
1142320  239c0000 000b8c2c 000b88d4 0100389f 00002c07 00000004 000bfa70 000bfa70 00410000 00000000 2c780010 0002438a
1142400  239c0000 000b88e4 000b8790 010038a7 00002c07 00000004 000bfaa0 000bfaa0 00410000 00000000 2c780010 0002438a
1142460  239c0000 000b87a0 000b8648 010038af 00002c07 00000004 000bfad0 000bfad0 00410000 00000000 2c780010 0002438a
1142540  239c0000 000b8658 2c780010 0002438a 239c0000 000b851c 000b76d4 02003627 00002c07 00000008 000bfb10 000bfb10
1142620  00410000 00000000 2c780010 0002438a 239c0000 000b83ec 000bfaf0 03003627 00002c07 0000000c 000bfb40 000bfb40
1142700  00410000 00000000 2c780010 0002438a 239c0000 000b76e4 000bd688 010038b7 00002c07 00000004 000bfb70 000bfb70
1142760  00410000 00000000 2c780010 0002438a 239c0000 000bd698 000bd6b8 010038bf 00002c07 00000004 000bfba0 000bfba0
1143040  00410000 00000000 2c780010 0002438a 239c0000 000bd6c8 000bd6e0 010038c7 00002c07 00000004 000bfbd0 000bfbd0
1143120  00410000 00000000 2c780010 0002438a 239c0000 000bd6f0 000bd708 010038cf 00002c07 00000004 000bfc00 000bfc00
1143200  00410000 00000000 2c780010 0002438a 239c0000 000bd718 000bd738 010038d7 00002c07 00000004 000bfc30 000bfc30
1143260  00410000 00000000 2c780010 0002438a 239c0000 000bd748 000bd768 010038df 00002c07 00000004 000bfc60 000bfc60
1143340  00410000 00000000 2c780010 0002438a 239c0000 000bd778 000bd798 010038e7 00002c07 00000004 000bfc90 000bfc90
1143420  00410000 00000000 2c780010 0002438a 239c0000 000bd7a8 000bd7c8 020038ef 00002c07 00000008 000bfcc0 000bfcc0
1143500  00410000 00000000 2c780010 0002438a 239c0000 000bd7d8 000bd7f8 010038f7 00002c07 00000004 000bfcf0 000bfcf0
1143560  00410000 00000000 2c780010 0002438a 239c0000 000bd808 000bd828 010038ff 00002c07 00000004 000bfd20 000bfd20
1143640  00410000 00000000 2c780010 0002438a 239c0000 000bd838 000bd850 01003907 00002c07 00000004 000bfd50 000bfd50
1143720  00410000 00000000 2c780010 0002438a 239c0000 000bd860 000bd870 0100390f 00002c07 00000004 000bfd80 000bfd80
1144000  00410000 00000000 2c780010 0002438a 239c0000 000bd880 000bd890 01003917 00002c07 00000004 000bfdb0 000bfdb0
1144060  00410000 00000000 2c780010 0002439a 239c0000 000bd8a0 000bd8b0 0100391f 00002c07 00000004 000bfde0 000bfde0
1144140  00410000 00000000 2c780010 0002438a 239c0000 000bd8c0 000bd8e0 01003927 00002c07 00000004 000bfe10 000bfe10
1144220  00410000 00000000 2c780010 0002438a 239c0000 000bd8f0 2c780010 0002438a 239c0000 000bd920 000bd940 0200392f
1144300  00002c07 00000008 000bfe50 000bfe50 00410000 00000000 2c780010 0002438a 239c0000 000bd950 00086973 615f6c69
1144360  7374006c 00066865 78746f62 000bfe78 00086f73 74725f74 6f620084 00086273 74725f74 6f620090 0008636f 6e763264
1144440  6967009c 2aa8a3d4 000ca3c4 000c7aa8 b4640000 000cada4 000cec7c b464dc64 000c80e8 000ccab0 00096c69 6e65696f
1144520  2e706c00 00087265 61646669 6c6500c0 0008666f 726d6c69 737400cc 0006746f 702e706c 00000000 0009616e 616c5f75
1144600  6e697400 00096572 726f7273 2e706c00 0009206f 6e206c69 6e652000 00066661 63746f72 000bff08 b464ff9c 000bb754
1144660  00000000 00067670 61727365 000bfefc 2b24ff9c 0002438a 000c4edc b464ff3c 000bb848 00000000 b464ff48 000bb818
1144740  00000000 0009736b 69705f6c 696e6500 00087075 745f6c69 6e650074 00097075 745f6368 61727300 00096667 65745f6c
1145020  696e6500 00086765 745f6c69 6e650098 2954000c 0002438a 48f8228c 00096374 79706573 2e706c00 000c0114 00000120
```

| | | | | | | | | | | | | |
|---|---|---|---|---|---|---|---|---|---|---|---|---|
| 1145100 | b288b66c | 000001be | 7fffffff | 000c2338 | 02000ce5 | 0100147d | 01002d65 | 0000000b | 00002aff | 000c000c | 0000002c | b288b66c |
| 1145160 | 000001be | 7fffffff | 000bffb8 | 02000ce5 | 0100147d | 01002d65 | 0000000b | 00002aff | 000c0038 | 0000002c | b288b66c | 000001be |
| 1145240 | 7fffffff | 000bffe4 | 02000ce5 | 0100147d | 01002d65 | 0000000b | 00002aff | 000c0070 | 00000038 | b27cb66c | 000001bf | 000001c5 |
| 1145320 | 000c00a0 | 02000ce5 | 05001b0d | 000039a7 | 00000013 | 00002c07 | 00610d23 | 00000243 | 00002aff | 000c009c | .0000002c | b4f0b4e4 |
| 1145400 | 000001be | 7fffffff | 0007eaad | 00000000 | 00000000 | 000c0118 | 0002438a | 000c23f8 | 000c0114 | 00000038 | b27cb66c | 000001c0 |
| 1145460 | 000001c6 | 000c0118 | 02000ce5 | 05001b0d | 000039af | 0000000b | 00002c07 | 00611b43 | 00000243 | 00002aff | 27f00040 | 000bb734 |
| 1145540 | 56f86854 | 69b03a4c | 0007f58c | 00182e7c | ada82ba0 | 0018001a | 3bf40000 | 000c2388 | 0014aa34 | 2e984354 | 242c0000 | 000c2368 |
| 1145620 | 2c582340 | 000c2368 | 000c0228 | 00000038 | b130b66c | 000001c1 | 000001c7 | 000c0075 | 02000ce5 | 05001b0d | 000035a7 | 0000000b |
| 1145700 | 00002c07 | 00611c43 | 00000243 | 00002aff | 000000dc | 000bb2cc | b27cb66c | 00000301 | 7fffffff | 000c0378 | 02000ce5 | 020031ed |
| 1145760 | 020031e5 | 00004127 | 02000a3d | 0100413d | 0000000c | 02000a3d | 02000885 | 000024ff | 00000010 | 02000885 | 00004127 | 00000014 |
| 1146040 | 020031f5 | 02003ebd | 00000018 | 00000001 | 0000001c | 00000020 | 02000a3d | 02000885 | 00000012 | 0200412d | 0000001a | 0000001e |
| 1146120 | 02000a3d | 02003bd5 | 02003ac5 | 00000024 | 03003abd | 0000001e | 00000028 | 0000002c | 0000001a | 02000a3d | 02000cdd | 0000001a |
| 1146200 | 01001b75 | 02003ac5 | 0000000e | 01004135 | 0000001e | 02000885 | 00000016 | 02003ebd | 0000001a | 00000022 | 00002aff | 000c0458 |
| 1146260 | 00000038 | b27cb66c | 00000302 | 00000345 | 000c045c | 02000ce5 | 05001b0d | 00004127 | 0000001b | 00002c07 | 00680083 | 0000027b |
| 1146340 | 00002aff | 27f00114 | 000c03ac | 5d100000 | 03003287 | 4b8c0000 | 00004127 | 64205818 | 67ec0018 | 55f06868 | 55f069b0 | 537056f8 |
| 1146420 | 671c5370 | 5d100000 | 020031f7 | 64205c30 | 02003ebf | 67ec001c | 55f06670 | 00245aec | 02000a3f | 65800020 | 5c9c0020 | 02000887 |
| 1146500 | 6e0858e0 | 0200412f | 6c84001c | 6c840024 | 51100000 | 02000a3f | 65800020 | 5c9c0020 | 02003bd7 | 67ec0020 | 6c84001c | 5c9c0020 |
| 1146560 | 02003ac7 | 5fa058e0 | 03003abf | 6c840024 | 5f8c5aec | 02000a3f | 61100020 | 5d100000 | 02000cdf | 6c84001c | 5a180000 | 01001b77 |
| 1146640 | 5a180000 | 02003ac7 | 671c58e0 | 01004137 | 6c840024 | 5c9c0020 | 02000887 | 6d3c58e0 | 02003ebf | 6c84001c | 6c344768 | 34a0001c |
| 1146720 | 36403614 | 0018247c | 000d0090 | 002031bc | 3e70001c | 3c480000 | 000cfff0 | 0018386c | 34302340 | 000d0010 | 0000003c | 000c0150 |
| 1147000 | b27cb66c | 00000303 | 7fffffff | 000c03e4 | 02000ce5 | 020031ed | 020031e5 | 00004127 | 00000007 | 02003ebd | 0000000c | 00000007 |
| 1147060 | 00002aff | 29540030 | 0002438a | 5d100000 | 03003287 | 4b8c0000 | 00004127 | 537055f0 | 671c5370 | 5d100000 | 02003ebf | 5fa05370 |
| 1147140 | 4960228c | 00000078 | 000c0378 | b27cb66c | 00000304 | 7fffffff | 000c0520 | 02000ce5 | 020031ed | 020031e5 | 0000410f | 02000a3d |
| 1147220 | 02000885 | 00004147 | 0000000c | 02000885 | 0000414f | 00000010 | 020031f5 | 01003ebd | 00000014 | 02000a3d | 02000885 | 0000000e |
| 1147300 | 01003ebd | 00000016 | 02000885 | 00000012 | 01003ebd | 00000016 | 00002aff | 000c05d8 | 00000038 | b27cb66c | 00000305 | 00000346 |
| 1147360 | 000c05dc | 02000ce5 | 05001b0d | 0000410f | 0000001b | 00002c07 | 0067f7c3 | 0000027b | 00002aff | 27f0008c | 000c0550 | 5d100000 |
| 1147440 | 03003287 | 4b8c0000 | 0000410f | 60cc56f8 | 671c55f0 | 682c5370 | 581867b8 | 53705c30 | 020031f7 | 65300018 | 5e540000 | 01003ebf |
| 1147520 | 67b85ec0 | 00000018 | 02000a3f | 66c0001c | 00185ec0 | 0000001c | 02000887 | 6b7458e0 | 01003ebf | 6c345ec0 | 00000018 | 02000887 |
| 1147600 | 6d3c58e0 | 01003ebf | 6c344768 | 33bc247c | 000d014c | 0018386c | 34302340 | 000d016c | 00000038 | 000c03e4 | b27cb66c | 00000306 |
| 1147660 | 7fffffff | 000c0588 | 02000ce5 | 020031ed | 020031e5 | 0000410f | 00000007 | 01003ebd | 0000000c | 00002aff | 2954002e | 0002438a |
| 1147740 | 5d100000 | 03003287 | 4b8c0000 | 0000410f | 537055f0 | 671c5370 | 5d100000 | 01003ebf | 5fa04960 | 228c2020 | 00000054 | 000c0520 |
| 1150020 | b27cb66c | 00000307 | 7fffffff | 000c0714 | 02000ce5 | 020031ed | 020031e5 | 00004147 | 02000885 | 00003ee7 | 0000000c | 020031f5 |
| 1150100 | 01003ebd | 00000010 | 02000885 | 0000000e | 01003ebd | 00000012 | 00002aff | 000c0d10 | 00000138 | b27cb66c | 00000308 | 00000347 |
| 1150160 | 000c0d14 | 02000ce5 | 05001b0d | 00004147 | 0000001b | 00002c07 | 00680a63 | 0000027b | 00002aff | 000c0650 | 00000040 | 000cfa0d |
| 1150240 | 000d039c | 00000000 | 00000000 | 000d0438 | 00000000 | 000d01d8 | 000d0330 | 000d0570 | 00000000 | 00000000 | 00000000 | 00000000 |
| 1150320 | 00000000 | 000c0d10 | 000000c0 | 00000000 | 000cf8dc | 000cf960 | 000cf9fc | 000d0438 | 000cfb14 | 000cfc24 | 000cfcb0 | 00000000 |
| 1150400 | 00000000 | 000cfd4d | 00000000 | 000cfdd0 | 00000000 | 000cffd0 | 000d012c | 000cfa0d | 000d039c | 000d0060 | 00000000 | 00000000 |
| 1150460 | 00000000 | 000d01d8 | 000cfea1 | 00000000 | 00000000 | 00000000 | 00000000 | 00000000 | 00000000 | 00000000 | 00000000 | 00000000 |
| 1150540 | 00000000 | 00000000 | 00000000 | 00000000 | 000cfe88 | 00000000 | 00000000 | 000d0570 | 000c8a08 | 000c8924 | 000cf4cc | 00000000 |
| 1150620 | 00000000 | 00000078 | 000c0588 | b27cb66c | 00000309 | 7fffffff | 000c0824 | 02000ce5 | 020031ed | 020031e5 | 00004147 | 02000a3d |
| 1150700 | 01002d65 | 02000a3d | 01002825 | 01003a65 | 0000000c | 01001b75 | 01003a65 | 000034c7 | 02000885 | 00003f4f | 00000010 | 020031f5 |
| 1150760 | 01003ebd | 00000014 | 02000885 | 00000012 | 01003ebd | 00000016 | 00002aff | 28c40098 | 000c0870 | 5d100000 | 03003287 | 4b8c0000 |
| 1151040 | 00004147 | 64205818 | 682c5370 | 56f8671c | 53705aec | 020031f7 | 60cc5aec | 01003ebf | 671c5c30 | 02000887 | 6d3c58e0 | 01003ebf |
| 1151120 | 6b7446ec | 476843e4 | 01003a67 | 5fa043c0 | 02000cdf | 4b8c0000 | 00002c07 | 6bb4247c | 0008042c | 001843e4 | 01003a67 | 4b8c0000 |
| 1151200 | 000034c7 | 447c0000 | 02000cdf | 4b8c0000 | 00002c07 | 6bb4247c | 0007eb8c | 0018231c | 000cc9c8 | 00000054 | 000c0714 | b27cb66c |
| 1151260 | 0000030a | 7fffffff | 000c08cc | 02000ce5 | 020031ed | 020031e5 | 00004147 | 02000885 | 00003ed7 | 0000000c | 020031f5 | 01003ebd |
| 1151340 | 00000010 | 02000885 | 000000e | 01003ebd | 00000012 | 00002aff | 28c40054 | 000c0918 | 5d100000 | 03003287 | 4b8c0000 | 00004147 |
| 1151420 | 60cc56f8 | 671c5370 | 581867b8 | 53705c30 | 020031f7 | 65300018 | 5e540000 | 01003ebf | 67b85ec0 | 00000018 | 02000887 | 6b7458e0 |
| 1151500 | 01003ebf | 6c3422bc | 000cc704 | 00000054 | 000c0824 | b27cb66c | 0000030b | 7fffffff | 000c0974 | 02000ce5 | 020031ed | 020031e5 |
| 1151560 | 00004147 | 02000885 | 00003edf | 0000000c | 020031f5 | 01003ebd | 00000010 | 02000885 | 0000000e | 01003ebd | 00000012 | 00002aff |
| 1151640 | 28c40054 | 000c09c0 | 5d100000 | 03003287 | 4b8c0000 | 00004147 | ,60cc56f9 | 671c5370 | 581867b8 | 53705c30 | 020031f7 | 65300018 |
| 1151720 | 5e540000 | 01003ebf | 67b85ec0 | 00000018 | 02000887 | 6b7458e0 | 01003ebf | 6c3422bc | 000cc74c | 00000054 | 000c08cc | b27cb66c |
| 1152000 | 0000030c | 7fffffff | 000c0a1c | 02000ce5 | 020031ed | 020031e5 | 00004147 | 02000885 | 00003eef | 0000000c | 020031f5 | 01003ebd |
| 1152060 | 00000010 | 02000885 | 0000000e | 01003ebd | 00000012 | 00002aff | 28c40054 | 000c0a68 | 5d100000 | 03003287 | 4b8c0000 | 00004147 |
| 1152140 | 60cc56f8 | 671c5370 | 581867b8 | 53705c30 | 020031f7 | 65300018 | 5e540000 | 01003ebf | 67b85ec0 | 00000018 | 02000887 | 6b7458e0 |

```
1152220  01003ebf 6c3422bc 000cc78c 00000054 000c0974 b27cb66c 0000030d 7fffffff 000c0ac4 02000ce5 020031ed 020031e5
1152300  00004147 02000885 0000408f 0000000c 020031f5 01003ebd 00000010 02000885 0000000e 01003ebd 00000012 00002aff
1152360  28c40054 000c0b10 5d100000 03003287 4b8c0000 00004147 60cc56f8 671c5370 581867b8 53705c30 020031f7 65300018
1152440  5e540000 01003ebf 67b85ec0 00000018 02000887 6b7458e0 01003ebf 6c3422bc 000cf63c 00000054 000c0a1c b27cb66c
1152520  0000030e 7fffffff 000c0b6c 02000ce5 020031ed 020031e5 00004147 02000885 00003f07 0000000c 020031f5 01003ebd
1152600  00000010 02000885 0000000e 01003ebd 00000012 00002aff 28c40054 000c0bb8 5d100000 03003287 4b8c0000 00004147
1152660  60cc56f8 671c5370 581867b8 53705c30 020031f7 65300018 5e540000 01003ebf 67b85ec0 00000018 02000887 6b7458e0
1152740  01003ebf 6c3422bc 000cc800 00000054 000c0ac4 b27cb66c 0000030f 7fffffff 000c0c14 02000ce5 020031ed 020031e5
1153020  00004147 02000885 00003f0f 0000000c 020031f5 01003ebd 00000010 02000885 0000000e 01003ebd 00000012 00002aff
1153100  28c40054 000c0c60 5d100000 03003287 4b8c0000 00004147 60cc56f8 671c5370 581867b8 53705c30 020031f7 65300018
1153160  5e540000 01003ebf 67b85ec0 00000018 02000887 6b7458e0 01003ebf 6c3422bc 000cc820 00000054 000c0b6c b27cb66c
1153240  00000310 7fffffff 000c0cbc 02000ce5 020031ed 020031e5 00004147 02000885 00003f17 0000000c 020031f5 01003ebd
1153320  00000010 02000895 0000000e 01003ebd 00000012 00002aff 29540054 0002438a 5d100000 03003287 4b8c0000 00004147
1153400  60cc56f8 671c5370 581867b8 53705c30 020031f7 65300018 5e540000 01003ebf 67b85ec0 00000018 02000887 6b7458e0
1153460  01003ebf 6c3422bc 000cc840 00000058 000c0c14 b27cb66c 00000311 7fffffff 000c0da4 02000ce5 020031ed 020031e5
1153540  00004117 02000885 00004097 0000000c 020031f5 01003ebd 00000010 02000885 0000000e 02003ebd 00000012 00000014
1153620  00002aff 000c0e18 00000038 b27cb66c 00000312 00000348 000c0e1c 02000ce5 05001b0d 00004117 0000001b 00002c07
1153700  0067f8c3 0000027b 00002aff 2c780058 0002438a 5d100000 03003287 4b8c0000 00004117 60cc56f8 671c5370 581867b8
1153760  53705c30 020031f7 65300018 5e540000 01003ebf 67b85ec0 00000019 02000887 6b7458e0 02003ebf 6c345fa0 239c0000
1154040  000cf7d8 00000078 000c0cbc b27cb66c 00000313 7fffffff 000c0ee0 02000ce5 020031ed 020031e5 0000414f 02000a3d
1154120  02000885 00004147 0000000c 02000885 0000414f 00000010 020031f5 01003ebd 00000014 02000a3d 02000885 0000000e
1154200  01003ebd 00000016 02000885 00000012 01003ebd 00000016 00002aff 000c0fcc 00000038 b27cb66c 00000314 00000349
1154260  000c0fd0 02000ce5 05001b0d 0000414f 0000001b 00002c07 00680b63 0000027b 00002aff 27f0008c 000c0f10 5d100000
1154340  03003287 4b8c0000 0000414f 60cc56f8 671c55f0 682c5370 581867b8 53705c30 020031f7 65300018 5e540000 01003ebf
1154420  67b85ec0 00000018 02000a3f 66c0001c 00185ec0 0000001c 02000887 6b7458e0 01003ebf 6c345ec0 00000018 02000887
1154500  6d3c58e0 01003ebf 6c344768 33bc247c 000d014c 0018386c 34302340 000d016c 00000038 000c04a4 b27cb66c 00000315
1154560  7fffffff 000c0f48 02000ce5 020031ed 020031e5 0000414f 00000007 01003ebd 0000000c 00002aff 2954002e 0002438a
1154640  5d100000 03003287 4b8c0000 0000414f 537055f0 671c5370 5d100000 01003ebf 5fa04960 228c166f 00000088 000c0ee0
1154720  b27cb66c 00000316 7fffffff 000c10c4 02000ce5 020031ed 020031e5 0000411f 02000a3d 02003645 00003437 0000000c
1155000  02000a3d 02003645 000034c7 00000010 02000a3d 02003645 00000014 00000018 010040b5 0000001c 020031f5 02003ebd
1155060  00000020 00000024 04003b55 00000022 00000016 00000026 0000001a 00002aff 000c14a4 00000038 b27cb66c 00000317
1155140  0000034a 000c14a8 02000ce5 05001b0d 0000411f 0000001b 00002c07 0067f9c3 0000027b 00002aff 27f000bc 000c115c
1155220  5d100000 03003287 4b8c0000 0000411f 60cc56f8 671c55f0 687c0028 55f06af0 002055f0 69b05370 581867b8 53705c30
1155300  020031f7 6530001c 5e540000 02003ebf 66700018 5c9c001c 04003b57 6c840018 6aa06c34 6af0001c 36a44768 35400018
1155360  002c362c 320c42ac 00003437 000cc5cc 00303540 00180024 3f68002c 38940028 320c42ac 000034c7 000cc5cc 002834e0
1155440  00183f68 00243894 0020382c 001c3aa0 000cc5cc 001838d4 3d6037dc 31f0234c 000cf990 000000a0 000c0f48 b27cb66c
1155520  00000318 7fffffff 000c1228 02000ce5 020031ed 020031e5 0000411f 02000a3d 02003645 00003437 0000000c 02000a3d
1155600  02003645 000034c7 00000010 02000a3d 02003645 00000014 00000018 02000a3d 0000083f 02000a3d 01002d65 01003b65
1155660  00000016 0100371d 0000001a 020031f5 02003ebd 0000001c 00000020 04003b55 0000001e 00000016 00000022 0000001a
1155740  00002aff 28c400c4 000c1280 5d100000 03003287 4b8c0000 0000411f 60cc56f8 671c55f0 687c0028 55f06af0 002055f0
1156020  6a005370 581867b8 53705c30 020031f7 6530001c 5e540000 02003ebf 66700018 5c9c001c 04003b57 6c840018 6af0001c
1156100  6c3469b0 36a4477c 35400019 002c362c 320c42ac 00003437 000cc5cc 00303540 00180024 3f68002c 38940028 320c42ac
1156160  000034c7 000cc5cc 00283500 00183f68 00243894 002037dc 3af4001c 000cc5cc 00202ecc 3af4001c 000c8c40 001c38e8
1156240  3d6c2330 000cc8c0 00000060 000c10c4 b27cb66c 00000319 7fffffff 000c1338 02000ce5 020031ed 020031e5 0000411f
1156320  02000a3d 02003645 00003437 0000000c 02000a3d 02003645 000034c7 00000010 0100371d 00000012 02003ebd 00000014
1156400  00000018 00002aff 28c40080 000c13a0 5d100000 03003287 4b8c0000 0000411f 60cc56f8 671c55f0 687c001c 55f06a00
1156460  53705818 67b85370 5e540000 02003ebf 5f8c36a4 477c3540 00180020 362c320c 43000000 00003437 000cc5cc 00243500
1156540  00183f68 00203894 001c3310 43000000 000034c7 000cc5cc 001c38e8 3d6c37f0 3cf4234c 000cc8c0 002b4d69 7373696e
1156620  6720776f 72642022 70726f63 65737322 20616674 65722022 656e6422 206f6e20 6c696e65 20000a57 00000070 000c1228
1156700  b27cb66c 0000031a 7fffffff 000c1440 02000ce5 020031ed 020031e5 0000411f 02000a3d 02003645 00003437 0000000c
1156760  0100371d 0000000e 020031f5 02003ebd 00000010 0000000e 02000a3d 01002ced 00004157 02000a3d 01002ced 0000000e
1157040  00002527 00002aff 29540099 0002438a 5d100000 03003287 4b8c0000 0000411f 60cc56f8 671c55f0 68405370 581867b8
1157120  53705c30 020031f7 66700018 5c9c0018 02003ebf 5fa069b0 5e540000 02000a3f 66700018 5c9c0018 01002cef 4b8c0000
1157200  00004157 5e540000 02000a3f 67b84af8 00002527 5e540000 01002cef 6d3c36a4 477c3500 0018362c 37dc42ac 00003437
1157260  000cc5cc 001c38e8 3d6c2330 000cc8c0 00000068 000c1338 b27cb66c 0000031b 7fffffff 000c1564 02000ce5 020031ed
```

| | | | | | | | | | | | | |
|---|---|---|---|---|---|---|---|---|---|---|---|---|
| 1157340 | 020031e5 | 000022b7 | 02000a3d | 02003645 | 0000000c | 00000010 | 010040dd | 00000014 | 020031f5 | 02003ff5 | 0000000e | 00000012 |
| 1157420 | 02000d0d | 02003f35 | 0000000e | 00000012 | 00002aff | 00002aff | 000c164c | 00000038 | b27cb66c | 0000031c | 0000034b | 000c1650 |
| 1157500 | 02000ce5 | 05001b0d | 000022b7 | 0000001b | 00002c07 | 0067f5c3 | 0000027b | 00002aff | 27f00084 | 000c1599 | 5d100000 | 03003287 |
| 1157560 | 4b8c0000 | 000022b7 | 64205819 | 67ec0020 | 55f0682c | 537056f8 | 671c5370 | 5d100000 | 020031f7 | 60cc5aec | 02003ff7 | 6110001c |
| 1157640 | 5e540000 | 02000d0f | 67b84af8 | 00002aff | 5e540000 | 02003f37 | 6b746c84 | 001c36a4 | 476834e0 | 00183678 | 00203614 | 001c247c |
| 1157720 | 000cc5cc | 001838d4 | 3d6037dc | 31f0234c | 000cfb74 | 0000003c | 000c1440 | b27cb66c | 0000031d | 7fffffff | 000c174c | 02000ce5 |
| 1160000 | 020031ed | 020031e5 | 000022b7 | 00000007 | 02003ff5 | 00000007 | 0000415f | 00002aff | 29540034 | 0002438a | 5d100000 | 03003287 |
| 1160060 | 4b8c0000 | 000022b7 | 537055f0 | 671c5370 | 5d100000 | 02003ff7 | 53704af8 | 0000415f | 4960228c | 00000050 | 000e6200 | b27cb66c |
| 1160140 | 0000031e | 7fffffff | 000c16c8 | 02000ce5 | 020031e5 | 01003715 | 0000000c | 02000a3d | 010040dd | 00000010 | 02000a3d | 0000083f |
| 1160220 | 01002d65 | 01003a9d | 01004165 | 0000000e | 00002aff | 0000002c | 000c1624 | b4f0b4e4 | 0000031d | 7fffffff | 000d04c9 | 0000007c |
| 1160300 | 00000018 | 000c15d4 | 0002438a | 000e59fc | 000c186c | 00000038 | b27cb66c | 0000031f | 0000034c | 000c1870 | 02000ce5 | 05001b0d |
| 1160360 | 00003717 | 00000023 | 00002c07 | 006827e3 | 0000027b | 00002aff | 27f00040 | 000c1704 | 45b85b58 | 03003287 | 61605370 | 5d7c0000 |
| 1160440 | 01003717 | 6d0c56f8 | 67505370 | 31f0247c | 000cfb74 | 00102ecc | 447c0000 | 01004167 | 6d0c234c | 000c87a0 | 00000044 | 000c15d4 |
| 1160520 | b27cb66c | 00000320 | 7fffffff | 000a91e8 | 02000ce5 | 020031e5 | 01003715 | 0000000c | 02000a3d | 00000007 | 01002d65 | 01003a9d |
| 1160600 | 0100416d | 0000000e | 00002aff | 29540040 | 0002438a | 36f40018 | 5d7c0000 | 03003287 | 61605370 | 5d7c0000 | 01003717 | 6c480018 |
| 1160660 | 55f85370 | 5370359c | 48c043c0 | 0100416f | 6c480018 | 239c0000 | 000c87a0 | 00000124 | 000c1564 | b27cb66c | 00000321 | 7fffffff |
| 1160740 | 000c1a94 | 02000ce5 | 020031ed | 020031e5 | 00003fd7 | 02000a3d | 02003645 | 0000000c | 00000010 | 02000a3d | 010036d5 | 00000014 |
| 1161020 | 02000a3d | 02000885 | 00004177 | 00000018 | 02000a3d | 010036dd | 0000001c | 010040b5 | 00000020 | 020031f5 | 01003ebd | 00000024 |
| 1161100 | 02000d0d | 02000a65 | 02003ba5 | 00000026 | 0000000e | 02000a3d | 00002aff | 02000a3d | 02000885 | 0000001a | 02003ff5 | 00000026 |
| 1161160 | 00000028 | 02000a3d | 02000cdd | 00000026 | 01001b85 | 02003ac5 | 00000012 | 02003d35 | 0000000e | 0000002a | 02000cdd | 00003d2f |
| 1161240 | 01001b85 | 04003d35 | 00000026 | 0000000e | 0000002a | 00000012 | 02000a3d | 01002ced | 0000417f | 02000a3d | 01002ced | 0000000e |
| 1161320 | 02000a3d | 01002ced | 00003ad7 | 02000a3d | 01002ced | 00000012 | 00002527 | 00002aff | 000c1d00 | 00000038 | b130b66c | 00000322 |
| 1161400 | 0000034d | 000ca861 | 02000ce5 | 05001b0d | 00003fd7 | 0000001b | 00002c07 | 00676de3 | 0000027b | 00002aff | 27f001ec | 000c1b7c |
| 1161460 | 51100000 | 03003287 | 4b8c0000 | 00003fd7 | 64205818 | 67ec0020 | 55f0687c | 002855f0 | 6af00020 | 55f06aa0 | 55f069b0 | 537056f8 |
| 1161540 | 671c5370 | 5d100000 | 020031f7 | 64205c30 | 01003ebf | 67ec0024 | 51100000 | 02000d0f | 60cc5aec | 02000a67 | 61100018 | 5d100000 |
| 1161620 | 02003ba7 | 6c840024 | 671c5ec0 | 00000018 | 02000a3f | 4b8c0000 | 00002aff | 5a180000 | 02000a3f | 66c00018 | 001c5ec0 | 00000018 |
| 1161700 | 02000887 | 6e580020 | 5a180000 | 02003ff7 | 6c840024 | 67ec0018 | 5c9c001c | 02000a3f | 66c0001c | 00285ec0 | 0000001c | 02000cdf |
| 1161760 | 6c840024 | 5a180000 | 01001b87 | 5a180000 | 02003ac7 | 67ec001c | 5a180000 | 02003d37 | 6b746c84 | 00185ec0 | 00000028 | 02000cdf |
| 1162040 | 4b8c0000 | 00003d2f | 5a180000 | 01001b87 | 5a180000 | 04003d37 | 6c840024 | 6b746c84 | 00186c84 | 001c5c30 | 02000a3f | 66700018 |
| 1162120 | 5c9c0018 | 01002cef | 4b8c0000 | 0000417f | 5e540000 | 02000a3f | 66700018 | 5c9c0018 | 01002cef | 6b745c30 | 02000a3f | 66700018 |
| 1162200 | 5c9c0018 | 01002cef | 4b8c0000 | 00003ad7 | 5e540000 | 02000a3f | 67b84af8 | 00002527 | 5e540000 | 01002cef | 6c84001c | 36a44768 |
| 1162260 | 35400018 | 002c3678 | 00203614 | 001c247c | 000cc5cc | 003034a0 | 00243eec | 002c382c | 002831f0 | 24d00000 | 000cf098 | 00283410 |
| 1162340 | 001c3e70 | 00243c9c | 00000020 | 000d0590 | 0020344c | 3eec001c | 381831f0 | 24d00000 | 000cf0d8 | 001838d4 | 3d6037dc | 31f0234c |
| 1162420 | 000cf990 | 000000f0 | 000c174c | b27cb66c | 00000323 | 7fffffff | 000ccc04 | 02000ce5 | 020031ed | 020031e5 | 00003fd7 | 02000a3d |
| 1162500 | 02003645 | 0000000c | 00000010 | 010040b5 | 00000014 | 020031f5 | 02003ebd | 00000018 | 02003d35 | 0000000e | 00000007 | 02000d0d |
| 1162560 | 02000a65 | 02003ba5 | 0000001a | 0000000e | 02000a3d | 00002aff | 02000a3d | 02000cdd | 0000001a | 01001b85 | 02003ac5 | 00000012 |
| 1162640 | 02003d35 | 0000000e | 00000007 | 02000cdd | 00003d2f | 01001b85 | 04003d35 | 0000001a | 0000000e | 00000007 | 00000012 | 02000a3d |
| 1162720 | 01002ced | 0000417f | 02000a3d | 01002ced | 0000000e | 02000a3d | 01002ced | 00003ad7 | 02000a3d | 01002ced | 00000012 | 00002527 |
| 1163000 | 00002aff | 29540180 | 0002438a | 5d100000 | 03003287 | 4b8c0000 | 00003fd7 | 64205818 | 67ec0020 | 55f0682c | 537056f8 | 671c5370 |
| 1163060 | 51100000 | 020031f7 | 60cc5aec | 02003ebf | 67ec0018 | 5a180000 | 02003d37 | 671c5370 | 5e540000 | 02000d0f | 6670001c | 5c9c001c |
| 1163140 | 02000a67 | 66c00024 | 001c5ec0 | 00000024 | 02003ba7 | 6c840018 | 6b745ec0 | 0000001c | 02000a3f | 4b8c0000 | 00002aff | 5a180000 |
| 1163220 | 02000a3f | 66c0001c | 00245ec0 | 0000001c | 02000cdf | 6c840018 | 5a180000 | 01001b87 | 5a180000 | 02003ac7 | 67ec001c | 5a180000 |
| 1163300 | 02003d37 | 6b745370 | 5c9c0024 | 02000cdf | 4b8c0000 | 00003d2f | 5a180000 | 01001b87 | 5a180000 | 04003d37 | 6c840018 | 6b745370 |
| 1163360 | 6c84001c | 5e540000 | 02000a3f | 66700018 | 5c9c0018 | 01002cef | 4b8c0000 | 0000417f | 5e540000 | 02000a3f | 66700018 | 5c9c0018 |
| 1163440 | 01002cef | 6b745c30 | 02000a3f | 66700018 | 5c9c0018 | 01002cef | 4b8c0000 | 00003ad7 | 5e540000 | 02000a3f | 67b84af8 | 00002527 |
| 1163520 | 5e540000 | 01002cef | 6c84001c | 36a44768 | 34c00018 | 36780020 | 3614001c | 24d00000 | 000cc5cc | 001838d4 | 3d6037dc | 31f0234c |
| 1163600 | 000cf990 | 000c23fc | 000002bc | 000cfa0d | 000d039c | 000d0060 | 00000000 | 00000000 | 00000000 | 000d01d8 | 000d0330 | 00000000 |
| 1163660 | 00000000 | 00000000 | 00000000 | 00000000 | 00000000 | 00000000 | 00000000 | 00000000 | 00000000 | 00000000 | 00000000 | 000d0438 |
| 1163740 | 000cfa15 | 000cfc24 | 000cfcb0 | 000d0570 | 00000000 | 000cfd3c | 00000000 | 000cfdd0 | 00000000 | 000c23fc | 0000023c | 000c1771 |
| 1164020 | 000bfe9c | 02000d27 | 000bfe79 | 000c1d7d | 02000a57 | 000c1d50 | 000c1d8d | 0000238f | 000c0bd9 | 000c1f4a | 000c0c61 | 000c1f52 |
| 1164100 | 02000d0f | 000c198e | 000c1b1a | 000c0d01 | 00000007 | 000c0d65 | 00000007 | 02000d0f | 000c19b2 | 000c1af2 | 000c0f31 | 00000007 |
| 1164160 | 000c0f71 | 00000007 | 02000d0f | 000c19d6 | 000c1aca | 000c10b9 | 00000007 | 000c10f9 | 00000007 | 02000d0f | 000c19fa | 000c1aa2 |
| 1164240 | 000c1241 | 00000007 | 000c1281 | 00000007 | 02000d0f | 000c1a1e | 000c1a2e | 000c13c9 | 00000007 | 000c1409 | 00000007 | 000c1515 |
| 1164320 | 000c1e8a | 02000d0f | 000c1a4a | 00000007 | 000c15b5 | 00000007 | 000c15f5 | 00000007 | 02000d0f | 000c1e62 | 00000007 | 02000d0f |
| 1164400 | 000c1e5a | 00000007 | 000c1e69 | 00000007 | 000c1e75 | 00000007 | 02000d0f | 000c1e3e | 000c1e82 | 02000d0f | 000c1e36 | 000c1e46 |

```
1164460  000c1e91 00000007 000c1e9d 00000007 02000d0f 000c1e22 000c1eaa 02000d0f 000c1e1a 000c1eb2 000c1eb9 00000007
1164540  000c1ec5 00000007 02000d0f 000c1e06 000c1ed2 02000d0f 000c1dfe 000c1eda 000c1ee1 00000007 000c1eed 00000007
1164620  02000d0f 000c1dea 000c1efa 02000d0f 000c1de2 000c1f02 000c1f09 00000007 000c1f15 00000007 02000d0f 000c1dce
1164700  000c1f22 02000d0f 000c1dc6 000c1f2a 000c1f31 00000007 000c1f3d 00000007 06002c57 00000013 000c179c 000c17a0
1164760  000bfe3d 000c0bc5 000c17ac 0300260f 000bfe58 000c1f59 000bfe60 02000d27 000c1f68 000c1f75 02000a57 000c1f6c
1165040  000c1f85 0300260f 000c0ae0 000c1795 000c0ae8 02000d27 0000233f 000c1f9d ffffffff 01003967 0000386f 00000004
1165120  000c212c 000c212c 0001004a 00000000 ffffffff 0200396f 0000386f 00000008 000bbaa4 000bbaa4 0001004a 00000000
1165200  000c1fb8 02003967 0000386f 00000008 000c2174 000c2174 0001004a 00000000 000c1fd8 0300396f 0000386f 0000000c
1165260  000bbb08 000bbb08 0001004a 00000000 ffffffff 01003977 0000386f 00000004 000c220c 000c220c 0001004a 00000000
1165340  ffffffff 0100397f 0000386f 00000004 000c21cc 000c21cc 0001004a 00000000 ffffffff 00003987 0000386f 00000000
1165420  000bbc00 000bbc00 0001004a 00000000 00202240 28232938 392f3038 2f323920 6c696e65 696f2e70 6c202020 2033332e
1165500  312200a1 000bd980 0100319f 0000386f 00000004 000c2104 000c2104 0001004a 00000000 00000028 000bd9b8 b27cb66c
1165560  000001a8 7fffffff 000f4850 02000ce5 01002c35 0000386f 00002aff 2cac20ea 0002438a 2ca00007 00000000 00000001
1165640  0009d6a8 0009d6a8 0002438a 000c2128 000916b4 2c780026 0002438a 45b83348 329c247c 000c2164 0018aa50 aab40000
1165720  a3ec3d00 4a7c000c 723c29a7 ffffffff 0200398f 0000386f 00000008 000bba18 000bba18 0001004a 00000000 2c78001e
1166000  0002438a 45b8129c 24d00000 000c2164 00143d00 4a7c000c 723c0838 ffffffff 020039a7 00002c07 00000008 000c2334
1166060  000c2334 00010048 00000000 27f00018 000c21f0 4e1c0000 00000007 239c0000 0007fd0c 2cac260f 0002438a 2ca021b1
1166140  00000000 00000001 000c21b4 000c21f0 000c21fa 000bde9c 2954001c 0002438a 56f8671c 682c247c 000801ec 00102340
1166220  000c2068 2cac21f5 0002438a 2ca021c8 00000000 00000001 000bf9c0 000c2234 000c223e 000c2230 000bf9cc 2954001c
1166300  0002438a 56f8671c 682c247c 000801ec 00102340 000c2048 000c1ff8 01003967 00002c07 00000004 000bdcc0 000bdcc0
1166360  00410000 00000000 000c2018 0200396f 00002c07 00000008 000bdc78 000bdc78 00410000 00000000 000c2250 02003967
1166440  00002c07 00000008 000bdc18 000bdc18 00410000 00000000 000c2270 0300396f 00002c07 0000000c 000bdbe0 000bdbe0
1166520  00410000 00000000 000c2038 01003977 00002c07 00000004 000bdba8 000bdba8 00410000 00000000 000c2058 0100397f
1166600  00002c07 00000004 000bda98 000bda98 00410000 00000000 000c2078 00003987 00002c07 00000000 000bdb28 000bdb28
1166660  00410000 00000000 000bb740 2c780024 0002438a 252046d8 24d00000 000804ec 001039a4 000c2368 000c234c 0008052c
1166740  0008077c 010039af 00002c07 00000004 000c2398 000c2338 00010048 00000000 000b76a4 010035a7 00002c07 00000004
1167020  000c23d0 000c23d0 00010048 00000000 2cac0211 0002438a 2ca0238a 00000000 00000001 000c00d0 000bb734 000c00da
1167100  000c2330 2c780012 0002438a 4e1c0000 fffffffb 228c0a57 2cac0e15 0002438a 2ca023e1 00000000 00000001 000c23bc
1167160  000c23bc 0002438a 000c23f4 000c23c8 000c2df0 000000bc b288b66c 000001da 7fffffff 000c4484 02000ce5 0100147d
1167240  01002d65 0000000b 00002aff 000c2454 0000002c b288b66c 000001da 7fffffff 000c2400 02000ce5 0100147d 01002d65
1167320  0000000b 00002aff 000c248c 00000038 b130b66c 000001db 000001df 000c2491 02000ce5 05001b0d 00003a0f 00000013
1167400  00002c07 00622463 0000022b 00002aff 000c2df0 0000002c b4f0b4e4 000001da 7fffffff 0007eaad 00000000 00000000
1167460  000c2458 0002438a 000c449c 28c401f4 000c2814 5d100000 03003287 4b8c0000 00004027 64205818 67ec001c 55f0687c
1167540  002455f0 6af0001c 55f069b0 537056f8 671c5370 5d100000 020031f7 64205c30 03003ebf 67ec0020 66c00028 00185aec
1167620  02000a3f 64205c30 02000887 6e580024 5a180000 02003ff7 6c940028 6c840018 5d100000 02000a3f 64205c30 02000887
1167700  613c58e0 02004007 6c840020 67b85aec 02000d0f 61100024 5d100000 02000a67 6580002c 5c9c002c 02000cdf 6c840020
1167760  5a180000 02003ac7 5fa058e0 0300344f 6c840018 53705fa0 5d100000 02000a3f 6580002c 5c9c002c 01002cef 4b8c0000
1170040  0000400f 5d100000 02000a3f 6580002c 5c9c002c 01002cef 6c840018 5d100000 02000a3f 6580002c 5c9c002c 01002cef
1170120  4b8c0000 00004017 5d100000 02000a3f 671c4af8 00002527 5d100000 01002cef 671c5ec0 00000024 02000a3f 66c0002c
1170200  00245ec0 0000002c 02000cdf 6c840028 5a180000 01001b77 5a180000 02003ac7 6aa058e0 02004047 53706c34 5c9c0024
1170260  02000cdf 6c840020 5a180000 01001b77 5a180000 02003ac7 6b7458e0 0300344f 6c840018 53706c34 36a44768 35400018
1170340  00283678 001c35c8 43000000 0000344f 000cc5cc 002c3410 00203e70 00283c9c 00000024 000cf2cc 002434e0 00183f68
1170420  00203894 001c3818 43000000 000034ef 000cc5cc 0018386c 3d302340 000cf0f8 0000016c 000b2af0 b27cb66c 000002c9
1170500  7fffffff 000c2a68 02000ce5 020031ed 020031e5 00004027 02000a3d 02003645 000034bf 0000000c 02000a3d 02000885
1170560  0000404f 00000010 02000a31 010036d5 00000014 02000a3d 02000885 00003fef 00000018 010036dd 0000001c 020031f5
1170640  03003ebd 00000020 00000024 00000028 02000a3d 02000885 00000012 02003ff5 00000026 0000002a 02000a3d 02000885
1170720  0000001a 02003ff5 00000026 0000002c 02000a3d 02000d0d 02000a65 03003b0d 00000022 0000002a 0000002e 02000a3d
1171000  01002ced 00004057 02000a3d 01002ced 0000002a 02000a3d 01002ced 00004017 02000a3d 01002ced 0000000e 02000a3d
1171060  01002ced 0000401f 00002527 02000a3d 02000cdd 00000026 01001b75 02003ac5 00000016 01004045 0000002e 02000cdd
1171140  00000022 01001b75 02003ac5 0000000e 020034bd 0000002a 0000002e 02000cdd 0000405f 01001b75 030034bd 00000022
1171220  0000002a 0000002e 00002aff 28c4024c 000c2b8c 5d100000 03003287 4b8c0000 00004027 64205818 67ec001c 55f0687c
1171300  002c55f0 6af00024 55f06aa0 55f069b0 537056f8 671c5370 5d100000 020031f7 64205c30 03003ebf 67ec0020 66c0002c
1171360  00185aec 02000a3f 64205c30 02000887 6e58002c 5a180000 02003ff7 6c84002c 6c840018 5d100000 02000a3f 64205c30
1171440  02000887 6e0858e0 02003ff7 6c84002c 67b85aec 02000a3f 61100024 5d100000 02000d0f 61100028 5d100000 02000a67
1171520  65800030 5c9c0030 03003b0f 6c840020 6c840018 6c345aec 02000a3f 65800030 5c9c0030 01002cef 4b8c0000 00004057
```

| | | | | | | | | | | | | |
|---|---|---|---|---|---|---|---|---|---|---|---|---|
| 1171600 | 5d100000 | 02000a3f | 65800030 | 5c9c0030 | 01002cef | 6c840018 | 5d100000 | 02000a3f | 65800030 | 5c9c0030 | 01002cef | 4b8c0000 |
| 1171660 | 00004017 | 5d100000 | 02000a3f | 61100030 | 5d100000 | 01002cef | 671c5ec0 | 00000030 | 02000a3f | 67ec0030 | 4b8c0000 | 00002527 |
| 1171740 | 5c9c0030 | 01002cef | 4b8c0000 | 0000401f | 5c9c0028 | 02000a3f | 66c00030 | 00285ec0 | 00000030 | 02000cdf | 6c84002c | 5a180000 |
| 1172020 | 01001b77 | 5a180000 | 02003ac7 | 6af00020 | 5a180000 | 01004047 | 6c345ec0 | 00000028 | 02000cdf | 6c840020 | 5a180000 | 01001b77 |
| 1172100 | 5a180000 | 02003ac7 | 6b7458e0 | 020034bf | 6c840018 | 6c345ec0 | 00000024 | 02000cdf | 4b8c0000 | 0000405f | 5a180000 | 01001b77 |
| 1172160 | 5a180000 | 030034bf | 6c840020 | 6c840018 | 6c3436a4 | 47683540 | 00180030 | 3678001c | 35c842ac | 000034bf | 000cc5cc | 00343410 |
| 1172240 | 00283e70 | 00303c9c | 0000002c | 000cf370 | 002c34a0 | 001c3eec | 0028382c | 00243c9c | 00000020 | 000cf098 | 002033bc | 3e70001c |
| 1172320 | 3c480000 | 000cf0b8 | 001838d4 | 3d6037dc | 31f0234c | 000cf0d8 | 0000012c | 000c26b0 | b27cb66c | 000002ca | 7fffffff | 000c2d50 |
| 1172400 | 02000ce5 | 020031ed | 020031e5 | 00004027 | 02000a3d | 02003645 | 020034bf | 0000000c | 02000885 | 0000404f | 00000010 | 020031f5 |
| 1172460 | 03003ebd | 00000014 | 00000018 | 0000001c | 02000a3d | 02000895 | 00000012 | 02003ff5 | 0000001a | 0000001e | 02000a3d | 02000d0d |
| 1172540 | 02000a65 | 02000cdd | 00000016 | 02003ac5 | 00000020 | 020034bd | 0000001e | 00000007 | 02000a3d | 01002ced | 00004057 | 02000a3d |
| 1172620 | 01002ced | 0000001e | 02000a3d | 01002ced | 00004017 | 02000a3d | 01002ced | 0000000e | 00002527 | 02000a3d | 02000cdd | 0000001a |
| 1172700 | 01001b75 | 02003ac5 | 0000000e | 01004045 | 00000007 | 02000cdd | 00000016 | 01001b75 | 02003ac5 | 0000000e | 020034bd | 0000001e |
| 1172760 | 00000007 | 02000cdd | 0000405f | 01001b75 | 030034bd | 00000016 | 0000001e | 00000007 | 00002aff | 295401bc | 0002438a | 5d100000 |
| 1173040 | 03003287 | 4b8c0000 | 00004027 | 64205819 | 67ec001c | 55f0682c | 537056f8 | 671c5370 | 5d100000 | 020031f7 | 64205c30 | 03003ebf |
| 1173120 | 67ec0018 | 66700028 | 5d100000 | 02000a3f | 65800020 | 5c9c0020 | 02000887 | 6d3c58e0 | 02003ff7 | 6c840028 | 6c345aec | 02000a3f |
| 1173200 | 61100020 | 5d100000 | 02000d0f | 61100024 | 5d100000 | 02000a67 | 6580002c | 5c9c002c | 02030cdf | 6c840018 | 5a180000 | 02003ac7 |
| 1173260 | 5fa058e0 | 020034bf | 6c345370 | 5d100000 | 02000a3f | 6580002c | 5c9c002c | 01002cef | 4b8c0000 | 00004057 | 5d100000 | 02000a3f |
| 1173340 | 6580002c | 5c9c002c | 01002cef | 6c345aec | 02000a3f | 6580002c | 5c9c002c | 01002cef | 4b8c0000 | 00004017 | 5d100000 | 02000a3f |
| 1173420 | 671c4af8 | 00002527 | 5d100000 | 01002cef | 671c5ec0 | 00000024 | 02000a3f | 66c0002c | 00245ec0 | 0000002c | 02000cdf | 6c840028 |
| 1173500 | 5a180000 | 01001b77 | 5a180000 | 02003ac7 | 6b7458e0 | 01004047 | 53705ec0 | 00000024 | 02000cdf | 6c840018 | 5a180000 | 01001b77 |
| 1173560 | 5a180000 | 02003ac7 | 6b7458e0 | 020034bf | 6c345370 | 5c9c0020 | 02000cdf | 4b8c0000 | 0000405f | 5a180000 | 01001b77 | 5a180000 |
| 1173640 | 030034bf | 6c840018 | 6c345370 | 36a44768 | 34e00018 | 3678001c | 35c842ac | 000034bf | 000cc5cc | 0018386c | 3d302340 | 000cf370 |
| 1173720 | 030000a4 | 000c2a68 | b27cb66c | 000002cb | 7fffffff | 000c2ed4 | 02000ce5 | 020031ed | 020031e5 | 0000403f | 02000a3d | 02003645 |
| 1174000 | 0000000c | 00000010 | 01002d65 | 02000a3d | 01003a65 | 00000014 | 02000a3d | 03004065 | 00000001 | 0000406f | 00000001 | 00000016 |
| 1174060 | 03000007 | 000006df | 00000019 | 03003ead | 0000001a | 0000000e | 0000001c | 020031f5 | 02003ff5 | 0000001e | 0000000e | 02000cdd |
| 1174140 | 0000001e | 01001b75 | 01003d3d | 00000012 | 00002aff | 000c3110 | 00000039 | b27cb66c | 000002cc | 00000333 | 000c3114 | 02000ce5 |
| 1174220 | 05001b0d | 0000403f | 0000001b | 00002c07 | 00679663 | 0000027b | 00002aff | 27f000a8 | 000c2f98 | 5d100000 | 03003287 | 4b8c0000 |
| 1174300 | 0000403f | 64205818 | 67ec001c | 537056f8 | 671c5370 | 5d100000 | 020031f7 | 64205c30 | 02003ff7 | 68546a00 | 5d100000 | 02000cdf |
| 1174360 | 6dc458e0 | 01001b77 | 5a180000 | 01003d3f | 671c36a4 | 37240018 | 3678001c | 35c839f8 | 000cc5cc | 001c32d4 | 24d00000 | 000c66c0 |
| 1174440 | 001c33a0 | 42540000 | 000006df | 45806dd8 | 53704538 | 4b8c0000 | 0000406f | 6c34247c | 000cf3e0 | 0018386c | 37f03cf4 | 242c0000 |
| 1174520 | 000cc62c | 000000cc | 000c2d50 | b27cb66c | 000002cd | 7fffffff | 000c3070 | 02000ce5 | 020031ed | 020031e5 | 0000403f | 02000a3d |
| 1174600 | 02003765 | 0000000c | 00000010 | 01002d65 | 02000a3d | 01003a65 | 00000014 | 02000a3d | 03004065 | 00000001 | 0000406f | 00000001 |
| 1174660 | 00000016 | 00000007 | 000006df | 00000018 | 02000a3d | 03004065 | 00000001 | 00003ce7 | 00000001 | 0000000e | 00000007 | 00003637 |
| 1174740 | 0000001c | 03003ead | 0000001a | 0000001e | 00000020 | 020031f5 | 02003ff5 | 00000022 | 01003ce5 | 0000000e | 02000cdd | 00000022 |
| 1175020 | 01001b75 | 01003d3d | 00000012 | 00002aff | 295400d0 | 0002438a | 5d100000 | 03003287 | 4b8c0000 | 0000403f | 64205818 | 67ec001c |
| 1175100 | 537056f9 | 671c5370 | 5d100000 | 020031f7 | 64205c30 | 02003ff7 | 685458e0 | 01003ce7 | 6aa05aec | 02000cdf | 6dc458e0 | 01001b77 |
| 1175160 | 5a180000 | 01003d3f | 671c36a4 | 37240018 | 3678001c | 35c83aa0 | 000cf1c8 | 002032f0 | 001c247c | 000c66c0 | 002033a0 | 42540000 |
| 1175240 | 000006df | 45806e1c | 001c5370 | 45384af8 | 0000406f | 6c34247c | 000cf3e0 | 001c33bc | 42540000 | 00003637 | 45806e08 | 53704538 |
| 1175320 | 4b8c0000 | 00003ce7 | 6c34247c | 000cf3e0 | 0018386c | 3d303cf4 | 242c0000 | 000cc62c | 000000a4 | 000c2ed4 | b27cb66c | 000002ce |
| 1175400 | 7fffffff | 000c31f4 | 02000ce5 | 020031ed | 020031e5 | 0000404f | 02000a3d | 02003645 | 0000000c | 00000010 | 01002d65 | 02000a3d |
| 1175460 | 01003a65 | 00000014 | 02000a3d | 03004065 | 00000001 | 000034bf | 00000001 | 00000016 | 00000007 | 000006df | 00000018 | 03003ead |
| 1175540 | 0000001a | 0000000e | 0000001c | 020031f5 | 02003ff5 | 0000001e | 0000000e | 02000cdd | 0000001e | 01001b75 | 01003d3d | 00000012 |
| 1175620 | 00002aff | 000c3410 | 00000039 | b27cb66c | 000002cf | 00000334 | 000c3414 | 02000ce5 | 05001b0d | 0000404f | 0000001b | 00002c07 |
| 1175700 | 00679b83 | 0000027b | 00002aff | 27f000a8 | 000c32b8 | 5d100000 | 03003287 | 4b8c0000 | 0000404f | 64205818 | 67ec001c | 537056f8 |
| 1175760 | 671c5370 | 5d100000 | 020031f7 | 64205c30 | 02003ff7 | 68546a00 | 5d100000 | 02000cdf | 6dc458e0 | 01001b77 | 5a180000 | 01003d3f |
| 1176040 | 671c36a4 | 37240018 | 3678001c | 35c839f8 | 000cc5cc | 001c32d4 | 24d00000 | 000c66c0 | 001c33a0 | 42540000 | 000006df | 45806dd8 |
| 1176120 | 53704538 | 4b8c0000 | 000034bf | 6c34247c | 000cf3e0 | 0018386c | 37f03cf4 | 242c0000 | 000cc62c | 000000cc | 000c3070 | b27cb66c |
| 1176200 | 000002d0 | 7fffffff | 000c3390 | 02000ce5 | 020031ed | 020031e5 | 0000404f | 02000a3d | 02003765 | 0000000c | 00000010 | 01002d65 |
| 1176260 | 02000a3d | 01003a65 | 00000014 | 02000a3d | 03004065 | 00000001 | 000034bf | 00000001 | 00000016 | 00000007 | 000006df | 00000018 |
| 1176340 | 02000a3d | 03004065 | 00000001 | 00003ce7 | 00000001 | 0000000e | 00000007 | 00003637 | 0000001c | 03003ead | 0000001a | 0000001e |
| 1176420 | 00000020 | 020031f5 | 02003ff5 | 00000022 | 01003ce5 | 0000000e | 02000cdd | 00000022 | 01001b75 | 01003d3d | 00000012 | 00002aff |
| 1176500 | 295400d0 | 0002438a | 5d100000 | 03003287 | 4b8c0000 | 0000404f | 64205818 | 67ec001c | 537056f8 | 671c5370 | 5d100000 | 020031f7 |
| 1176560 | 64205c30 | 02003ff7 | 695458e0 | 01003ce7 | 6aa05aec | 02000cdf | 6dc458e0 | 01001b77 | 5a180000 | 01003d3f | 671c36a4 | 37240018 |
| 1176640 | 3678001c | 35c83aa0 | 000cf1c8 | 002032f0 | 001c247c | 000c66c0 | 002033a0 | 42540000 | 000006df | 45806e1c | 001c5370 | 45384af8 |

| | | | | | | | | | | | | |
|---|---|---|---|---|---|---|---|---|---|---|---|---|
| 1176720 | 000034bf | 6c34247c | 000cf3e0 | 001c33bc | 42540000 | 00003637 | 45806e08 | 53704538 | 4b8c0000 | 00003ce7 | 6c34247c | 000cf3e0 |
| 1177000 | 0018386c | 3d303cf4 | 242c0000 | 000cc62c | 00000084 | 000c31f4 | b27cb66c | 000002d1 | 7fffffff | 000c34e4 | 02000ce5 | 020031ed |
| 1177060 | 020031e5 | 00003fef | 02000885 | 00004077 | 0000000c | 02000a3d | 020031f5 | 02003ff5 | 00000010 | 00000014 | 02000885 | 0000000e |
| 1177140 | 02003ff5 | 00000012 | 00000016 | 020031f5 | 02003ffd | 00000012 | 00000016 | 02000885 | 0000000e | 02003ffd | 00000012 | 00000016 |
| 1177220 | 00002aff | 000c3518 | 00000038 | b27cb66c | 000002d2 | 00000335 | 000c351c | 02000ce5 | 05001b0d | 00003fef | 0000001b | 00002c07 |
| 1177300 | 006785c3 | 0000027b | 00002aff | 2c780098 | 0002438a | 5d100000 | 03003287 | 4b8c0000 | 00003fef | 60cc56f8 | 671c5370 | 58186530 |
| 1177360 | 001c5c30 | 020031f7 | 65300020 | 5e540000 | 02003ff7 | 66700018 | 5c9c0020 | 02000887 | 6b7458e0 | 02003ff7 | 6c840018 | 6c345878 |
| 1177440 | 001c67ec | 001c5370 | 5c9c001c | 020031f7 | 66c00020 | 001c5ec0 | 00000020 | 02003fff | 6c840018 | 6c345ec0 | 0000001c | 02000887 |
| 1177520 | 6b7458e0 | 02003fff | 6c840018 | 6c3422bc | 000cf4ec | 00000038 | 000c3390 | b27cb66c | 000002d3 | 7fffffff | 000c3584 | 02000ce5 |
| 1177600 | 020031ed | 020031e5 | 0000402f | 00000007 | 01003ebd | 0000000c | 00002aff | 000c36d8 | 00000038 | b27cb66c | 000002d4 | 00000336 |
| 1177660 | 000c36dc | 02000ce5 | 05001b0d | 0000402f | 0000001b | 00002c07 | 00679243 | 0000027b | 00002aff | 27f0002e | 000c35f4 | 5d100000 |
| 1177740 | 03003287 | 4b8c0000 | 0000402f | 537055f0 | 671c5370 | 5d100000 | 01003ebf | 5fa04960 | 228c088f | 00000078 | 000c34e4 | b27cb66c |
| 1200020 | 000002d5 | 7fffffff | 000c3688 | 02000ce5 | 020031ed | 020031e5 | 0000402f | 02000a3d | 02000885 | 0000407f | 0000000c | 02000885 |
| 1200100 | 00004087 | 00000010 | 020031f5 | 01003ebd | 00000014 | 02000a3d | 02000885 | 0000000e | 01003ebd | 00000016 | 02000885 | 00000012 |
| 1200160 | 01003ebd | 00000016 | 00002aff | 2954008c | 0002438a | 5d100000 | 03003287 | 4b8c0000 | 0000402f | 60cc56f8 | 671c55f0 | 682c5370 |
| 1200240 | 581867b8 | 53705c30 | 020031f7 | 65300018 | 5e540000 | 01003ebf | 67b85ec0 | 00000018 | 02000a3f | 66c0001c | 00185ec0 | 0000001c |
| 1200320 | 02000887 | 6b7458e0 | 01003ebf | 6c345ec0 | 00000018 | 02000897 | 6d3c58e0 | 01003ebf | 6c344768 | 33bc247c | 000cf5b4 | 0018386c |
| 1200400 | 3d302340 | 000cf5d4 | 00000054 | 000c3584 | b27cb66c | 000002d6 | 7fffffff | 000c37e8 | 02000ce5 | 020031ed | 020031e5 | 0000407f |
| 1200460 | 02000885 | 0000408f | 0000000c | 020031f5 | 01003ebd | 00000010 | 02000895 | 0000000e | 01003ebd | 00000012 | 00002aff | 000c3764 |
| 1200540 | 00000038 | b27cb66c | 000002d7 | 00000337 | 000c3c10 | 02000ce5 | 05001b0d | 0000407f | 0000001b | 00002c07 | 0067ada3 | 0000027b |
| 1200620 | 00002aff | 27f00054 | 000c0784 | 5d100000 | 03003287 | 4b8c0000 | 00004147 | 60cc56f8 | 671c5370 | 581867b8 | 53705c30 | 020031f7 |
| 1200700 | 65300018 | 5e540000 | 01003ebf | 67b85ec0 | 00000018 | 02000887 | 6b7458e0 | 01003ebf | 6c3422bc | 000cc76c | 000c3c0c | 0000002c |
| 1200760 | 000cfea1 | 000cfc24 | 000cfcb0 | 00000000 | 000c8a08 | 000cfd4d | 000cf4cc | 000cfdd0 | 00000000 | 27f00054 | 000c3834 | 5d100000 |
| 1201040 | 03003287 | 4b8c0000 | 0000407f | 60cc56f8 | 671c5370 | 581867b8 | 53705c30 | 020031f7 | 65300018 | 5e540000 | 01003ebf | 67b85ec0 |
| 1201120 | 00000018 | 02000887 | 6b7458e0 | 01003ebf | 6c3422bc | 000cf63c | 00000054 | 000c3688 | b27cb66c | 000002d8 | 7fffffff | 000c3890 |
| 1201200 | 02000ce5 | 020031ed | 020031e5 | 0000407f | 02000885 | 00003ee7 | 0000000c | 020031f5 | 01003ebd | 00000010 | 02000885 | 0000000e |
| 1201260 | 01003ebd | 00000012 | 00002aff | 28c40054 | 000c3900 | 5d100000 | 03003287 | 4b8c0000 | 0000407f | 60cc56f8 | 671c5370 | 581867b8 |
| 1201340 | 53705c30 | 020031f7 | 65300019 | 5e540000 | 01003ebf | 67b85ec0 | 00000018 | 02000887 | 6b7458e0 | 01003ebf | 6c3422bc | 000cc76c |
| 1201420 | 00000078 | 000c37e8 | b27cb66c | 000002d9 | 7fffffff | 000c39a0 | 02000ce5 | 020031ed | 020031e5 | 0000407f | 02000a3d | 01002d65 |
| 1201500 | 02000a3d | 01002825 | 01003a65 | 0000000c | 01001b75 | 01003a65 | 0000344f | 02000885 | 00003f4f | 00000010 | 020031f5 | 01003ebd |
| 1201560 | 00000014 | 02000885 | 00000012 | 01003ebd | 00000016 | 00002aff | 28c40098 | 000c39ec | 5d100000 | 03003287 | 4b8c0000 | 0000407f |
| 1201640 | 64205818 | 682c5370 | 56f8671c | 53705aec | 020031f7 | 60cc5aec | 01003ebf | 671c5c30 | 02000887 | 6d3c58e0 | 01003ebf | 6b7446ec |
| 1201720 | 476843e4 | 01003a67 | 5fa043c0 | 02000cdf | 4b8c0000 | 00002c07 | 6bb4247c | 0008042c | 001843e4 | 01003a67 | 4b8c0000 | 0000344f |
| 1202000 | 447c0000 | 02000cdf | 4b8c0000 | 00002c07 | 6bb4247c | 0007eb8c | 0018231c | 000cc9c8 | 00000054 | 000c3890 | b27cb66c | 000002da |
| 1202060 | 7fffffff | 000c3a48 | 02000ce5 | 020031ed | 020031e5 | 0000407f | 02000885 | 00003ed7 | 0000000c | 020031f5 | 01003ebd | 00000010 |
| 1202140 | 02000885 | 0000000e | 01003ebd | 00000012 | 00002aff | 28c40054 | 000c3a94 | 5d100000 | 03003287 | 4b8c0000 | 0000407f | 60cc56f8 |
| 1202220 | 671c5370 | 581867b8 | 53705c30 | 020031f7 | 65300018 | 5e540000 | 01003ebf | 67b85ec0 | 00000018 | 02000887 | 6b7458e0 | 01003ebf |
| 1202300 | 6c3422bc | 000cc704 | 00000054 | 000c39a0 | b27cb66c | 000002db | 7fffffff | 000c3af0 | 02000ce5 | 020031ed | 020031e5 | 0000407f |
| 1202360 | 02000885 | 00003edf | 0000000c | 020031f5 | 01003ebd | 00000010 | 02000885 | 0000000e | 01003ebd | 00000012 | 00002aff | 28c40054 |
| 1202440 | 000c3b3c | 51100000 | 03003287 | 4b8c0000 | 0000407f | 60cc56f8 | 671c5370 | 581867b8 | 53705c30 | 020031f7 | 65300018 | 5e540000 |
| 1202520 | 01003ebf | 67b85ec0 | 00000019 | 02000887 | 6b7458e0 | 01003ebf | 6c3422bc | 000cc74c | 00000054 | 000c3a48 | b27cb66c | 000002dc |
| 1202600 | 7fffffff | 000c3b98 | 02000ce5 | 020031ed | 020031e5 | 0000407f | 02000885 | 00003eef | 0000000c | 020031f5 | 01003ebd | 00000010 |
| 1202660 | 02000885 | 0000000e | 01003ebd | 00000012 | 00002aff | 29540054 | 0002438a | 5d100000 | 03003287 | 4b8c0000 | 0000407f | 60cc56f8 |
| 1202740 | 671c5370 | 581867b8 | 53705c30 | 020031f7 | 65300018 | 5e540000 | 01003ebf | 67b85ec0 | 00000018 | 02000887 | 6b7458e0 | 01003ebf |
| 1203020 | 6c3422bc | 000cc78c | 00000078 | 000c3af0 | b27cb66c | 000002dd | 7fffffff | 000c3cd4 | 02000ce5 | 020031ed | 020031e5 | 00004087 |
| 1203100 | 02000a3d | 02000885 | 0000407f | 0000000c | 02000885 | 00004087 | 00000010 | 020031f5 | 01003ebd | 00000014 | 02000a3d | 02000885 |
| 1203160 | 0000000e | 01003ebd | 00000015 | 02000985 | 00000012 | 01003ebd | 00000016 | 00002aff | 000c3d70 | 00000038 | b27cb66c | 000002de |
| 1203240 | 00000338 | 000c3d74 | 02000ce5 | 05001b0d | 00004087 | 0000001b | 00002c07 | 0067aea3 | 0000027b | 00002aff | 27f0008c | 000c3d04 |
| 1203320 | 5d100000 | 03003287 | 4b8c0000 | 00004097 | 60cc56f8 | 671c55f0 | 682c5370 | 581867b8 | 53705c30 | 020031f7 | 65300019 | 5e540000 |
| 1203400 | 01003ebf | 67b85ec0 | 00000018 | 02000a3f | 66c0001c | 00185ec0 | 0000001c | 02000887 | 6b7458e0 | 01003ebf | 6c345ec0 | 00000018 |
| 1203460 | 02000887 | 6d3c58e0 | 01003ebf | 6c344768 | 33bc247c | 000cf5b4 | 0018386c | 3d302340 | 000cf5d4 | 00000038 | 000c3b98 | b27cb66c |
| 1203540 | 000002df | 7fffffff | 000c3d3c | 02000ce5 | 020031ed | 020031e5 | 00004087 | 00000007 | 01003ebd | 0000000c | 00002aff | 2954002e |
| 1203620 | 0002438a | 5d100000 | 03003287 | 4b8c0000 | 00004087 | 537055f0 | 671c5370 | 5d100000 | 01003ebf | 5fa04960 | 228c0000 | 00000038 |
| 1203700 | 000c3cd4 | b27cb66c | 000002e0 | 7fffffff | 000c3ddc | 02000ce5 | 020031ed | 020031e5 | 00004037 | 00000007 | 01003ebd | 0000000c |
| 1203760 | 00002aff | 000c3f5c | 00000038 | b27cb66c | 000002e1 | 00000339 | 000c3f60 | 02000ce5 | 05001b0d | 00004037 | 0000001b | 00002c07 |

```
1204040  00679343 0000027b 00002aff 27f0002e 000c3e2c 5d100000 03003287 4b8c0000 00004037 537055f0 671c5370 5d100000
1204120  01003ebf 5fa04960 228c0000 00000058 000c3d3c b27cb66c 000002e2 7fffffff 000c3e8c 02000ce5 020031ed 020031e5
1204200  00004037 02000885 00004097 0000000c 020031f5 01003ebd 00000010 02000885 0000000e 02003ebd 00000012 00000014
1204260  00002aff 29540058 0002438a 5d100000 03003287 4b8c0000 00004037 60cc56f8 671c5370 581867b8 53705c30 020031f7
1204340  65300018 5e540000 01003ebf 67b85ec0 00000018 02000887 6b7458e0 02003ebf 6c345fa0 239c0000 000cf7d8 000000d4
1204420  000c3ddc b27cb66c 000002e3 7fffffff 000c40a0 02000ce5 020031ed 020031e5 00004077 02000a3d 02000885 0000409f
1204500  0000000c 02000885 000040a7 00000010 02000a3d 020031f5 02003ff5 00000014 00000001 00000018 0000001c 02000a3d
1204560  02000885 0000000e 02003ff5 00000016 0000001a 02000885 00000012 02003ff5 00000016 0000001e 020031f5 02003ffd
1204640  00000016 00000001 0000001a 0000001e 02000a3d 02000885 0000000e 02003ffd 00000016 0000001a 02000885 00000012
1204720  02003ffd 00000016 0000001e 00002aff 000c4120 00000038 b27cb66c 000002e4 0000033a 000c4124 02000ce5 05001b0d
1205000  00004077 0000001b 00002c07 0067a763 0000027b 00002aff 2c780108 0002438a 5d100000 03003287 4b8c0000 00004077
1205060  60cc56f8 671c55f0 682c5370 58186530 001c5c30 020031f7 65300024 5e540000 02003ff7 67ec0018 55f06670 00205ec0
1205140  00000024 02000a3f 66c00028 00245ec0 00000028 02000887 6b7458e0 02003ff7 6c840018 6c840020 5c9c0024 02000887
1205220  613c58e0 02003ff7 6c840018 6c345879 001c67ec 001c5370 5c9c001c 020031f7 66c00024 001c5ec0 00000024 02003fff
1205300  6c840018 55f06c84 00206c34 5c9c001c 02000a3f 66c00024 001c5ec0 00000024 02000887 6b7458e0 02003fff 6c840018
1205360  6c840020 5c9c001c 02000887 6d3c58e0 02003fff 6c840018 6c344768 33bc247c 000cf864 0018386c 31302340 000cf884
1205440  00000084 000c3e8c b27cb66c 000002e5 7fffffff 000c41f4 02000ce5 020031ed 020031e5 0000409f 02000885 000040af
1205520  0000000c 02000a3d 020031f5 02003ff5 00000010 00000014 02000885 0000000e 02003ff5 00000012 00000016 020031f5
1205600  02003ffd 00000012 00000016 02000885 0000000e 02003ffd 00000012 00000016 00002aff 000c42d0 00000038 b27cb66c
1205660  000002e6 0000033b 000c42d4 02000ce5 05001b0d 0000409f 0000001b 00002c07 0067c323 0000027b 00002aff 2c780098
1205740  0002438a 5d100000 03003287 4b8c0000 0000409f 60cc56f8 671c5370 58186530 001c5c30 020031f7 65300020 5e540000
1206020  02003ff7 66700018 5c9c0020 02000887 6b7458e0 02003ff7 6c840018 6c345878 001c67ec 001c5370 5c9c001c 020031f7
1206100  66c00020 001c5ec0 00000020 02003fff 6c840018 6c345ec0 0000001c 02000887 6b7458e0 02003fff 6c840018 6c3422bc
1206160  000cf90c 000000e0 000c40a0 b27cb66c 000002e7 7fffffff 000c430c 02000ce5 020031ed 020031e5 000040a7 02000a3d
1206240  010040b5 0000000c 02000a3d 02000885 0000409f 00000010 02000885 000040a7 00000014 02000a3d 020031f5 02003ff5
1206320  00000018 00000001 0000001c 00000020 02000a3d 02000885 00000012 02003ff5 0000001a 0000001e 02000885 00000016
1206400  02003ff5 0000001a 00000022 020031f5 02003ffd 0000001a 00000001 0000001e 00000022 02000a3d 02000885 00000012
1206460  02003ffd 0000001a 0000001e 02000885 00000016 02003ffd 0000001a 00000022 00002aff 000c4390 00000038 b27cb66c
1206540  000002e8 0000033c 000cc4cc 02000ce5 05001b0d 000040a7 0000001b 00002c07 0067c423 0000027b 00002aff 0000004c
1206620  000c41f4 b27cb66c 000002e9 7fffffff 000cc448 02000ce5 020031ed 020031e5 000040a7 00000007 02000a3d 02003ff5
1206700  0000000c 00000007 02003ffd 00000010 00000007 00002aff 2954003c 0002438a 5d100000 03003287 4b8c0000 000040a7
1206760  517055f0 64205c30 02003ff7 5fa05370 56f8571c 53705aec 02003fff 5fa05370 4960228c 000c4568 00000074 00000000
1207040  00000000 00000000 00000000 00000000 00000000 00000000 00000000 00000000 00000000 00000000 00000000 00000000
*
1207200  00000000 00000000 0012496c 6c656761 6c206368 61726163 74657220 0007e92d 2c780018 0002438a 42400000 000039df
1207260  239c0000 00080d0c 001e2069 6e207468 65206c69 74657261 6c20666f 756e6420 696e206c 696e6520 00000000 000e496c
1207340  6c656761 6c206469 67697420 00000000 0011496c 6c656761 6c20616c 70686162 65742000 ffffffff 02003a0f 00002c07
1207420  00000008 000c44a0 000c44a0 00010045 00000000 000c8ed4 2c780020 0002438a 252046d8 332c247c 000c21a4 0014437c
1207500  31302340 000b4e28 000e616e 616c797a 696e675f 66696c65 000aabf8 000e8eb8 000cdb78 00292f68 6f6d652f 6f736173
1207560  312f612f 73726565 2f73656d 616e7469 635f6368 65636b31 2f617578 666e7300 002c2f68 6f6d652f 6f736173 312f612f
1207640  73726565 2f73656d 616e7469 635f6368 65636b31 2f617578 666e732e 706c0073 0000002c 000c680c b27cb66c 000001f4
1207720  7fffffff 000b0cd8 02000ce5 0200293d 00003a97 0000026b 00002aff 000c4684 000000d0 b27cb66c 000001f5 0000022d
1210000  0009caf0 02000ce5 0500236d 00001d57 00002367 0000026b 0200095d 00000133 00000023 0000313f 00002aff 000c45d4
1210060  0000002c b27cb66c 000001f6 0000022e 0009cbc1 02000ce5 02002385 00003a97 00002c07 00002aff 000c460c 00000038
1210140  b27cb66c 000001f7 00000230 000c4688 02000ce5 05001b0d 00003a9f 0000000b 00002c07 00643d03 0000026b 00002aff
1210220  000c4684 0000002c b4f0b4e4 000001f6 7fffffff 0007eaad 00000000 00000000 000b206c 0002438a 0009f094 2c78004c
1210300  0002438a 45b82e7c ada82ba0 00140022 447c0000 02000cdf 4b8c0000 00002c07 6d0c247c 0007ed2c 0014aa34 2e9822a0
1210360  2c5843c0 02000cdf 4b8c0000 00002c07 6d0c234c 0007eb8c 000c471c 00000038 b27cb66c 000001f8 00000231 000c4720
1210440  02000ce5 05001b0d 00003aa7 0000000b 00002c07 00643f03 0000026b 00002aff 2c780060 0002438a 45b82e7c ada82ba0
1210520  00140036 447c0000 02000cdf 4b8c0000 00002c07 6d0c247c 0007ed2c 0014aa34 2e9843c0 02000cdf 4b8c0000 00002c07
1210600  6d0c234c 000803ec 2c5843c0 02000cdf 4b8c0000 00002c07 6d0c234c 0007eb8c 000c47b4 00000038 b27cb66c 000001f9
1210660  00000232 000c47bc 02000ce5 05001b0d 00003aaf 0000000b 00002c07 00644103 0000026b 00002aff 2c780064 0002438a
1210740  45b82e7c ada82ba0 0014003a 447c0000 02000cdf 4b8c0000 00002c07 6d0c247c 0007ed2c 0014aa34 2e9843c0 02000cdf
1211020  4b8c0000 00002c07 6d0c247c 000803ec 0010c5a8 2c5843c0 02000cdf 4b8c0000 00002c07 6d0c234c 0007eb8c 000c48c8
1211100  00000038 b27cb66c 000001fa 00000233 000c48cc 02000ce5 05001b0d 00003ab7 0000001b 00002c07 00644463 0000026b
```

```
1211160  00002aff 295400d8 0002438a 45b846ec 51e80000 03003abf 671c6aa0 6a5056f8 6af00020 6af0001c 2e7cae74 00242ba0
1211240  00280064 447c0000 03003abf 6e580020 5f8c43e4 02003ac7 5fa06b74 3b4c0000 0007e68c 0028aa88 00242e98 43000000
1211320  00003acf 00080d0c 00243c9c 00000020 00080d0c 002442ac 00003ad7 00080d0c 002439f8 00080d0c 0024247c 0007fd0c
1211400  00242c88 00322c58 44a00000 03003abf 6e580020 6e086dc4 447c0000 02003ac7 6d506bb4 44a00000 01001b87 6b7439a4
1211460  0007e68c 00204408 03003abf 6e58001c 6e086dc4 24100000 000c888c 000c49d8 00000038 b27cb66c 000001fb 00000234
1211540  000c49dc 02000ce5 05001b03 00003adf 0000001b 00002c07 006448a3 0000026b 00002aff 295400d8 0002438a 45b846ec
1211620  51e80000 03003ae7 671c6aa0 6a5056f8 6af00020 6af0001c 2e7cae74 00242ba0 00280064 447c0000 03003ae7 6e580020
1211700  5f8c43e4 02003ac7 5fa06b74 3b4c0000 0007e68c 0028aa88 00242e98 43000000 00003aef 00080d0c 00243c9c 00000020
1211760  00080d0c 002442ac 00003ad7 00080d0c 002439f8 00080d0c 0024247c 0007fd0c 00242c88 00322c58 44a00000 03003ae7
1212040  6e580020 6e086dc4 447c0000 02003ac7 6d506bb4 44a00000 01001b87 6b7439a4 0007e68c 00204408 03003ae7 6e58001c
1212120  6e086dc4 24100000 000c8914 000c4ae8 00000038 b27cb66c 000001fc 00000235 000c4aec 02000ce5 05001b0d 00003af7
1212200  0000001b 00002c07 00644ca3 0000026b 00002aff 295400d8 0002438a 45b846ec 51e80000 03001d6f 671c6aa0 6a5056f8
1212260  6af00020 6af0001c 2e7cae74 00242ba0 00280064 447c0000 03001d6f 6e580020 5f8c43e4 02003ac7 5fa06b74 3b4c0000
1212340  0007e68c 0028aa88 00242e98 43000000 00003aff 00080d0c 00243c9c 00000020 00080d0c 002442ac 00003ad7 00080d0c
1212420  002439f8 00080d0c 0024247c 0007fd0c 00242c88 00322c58 44a00000 03001d6f 6e580020 6e086dc4 447c0000 02003ac7
1212500  6d506bb4 44a00000 01001b87 6b7439a4 0007e68c 00204408 03001d6f 6e58001c 6e086dc4 24100000 000c8994 000c4e60
1212560  000000a8 b27cb66c 000001fd 00000236 000c4b24 02000ce5 05001b0d 00003b07 0000001b 00002c07 00644fc3 0000026b
1212640  00002aff 000c4b58 00000038 b27cb66c 000001fe 00000237 000c4b5c 02000ce5 05001b0d 00003b0f 0000001b 00002c07
1212720  00645343 0000026b 00002aff 000c4e60 00000038 b27cb66c 000001ff 00000238 000c4e64 02000ce5 05001b0d 00003b17
1213000  00000023 00002c07 00645703 0000026b 00002aff 2c78002c 0002438a 45b83574 4768332c 24d00000 0007fccc 001838d4
1213060  42680000 00000003 3d302340 000c8f64 000e6663 6f6e7632 64656369 6d616c31 000c6e70 27f00046 000c4c14 5d7c0000
1213140  02003b1f 671c5370 5d100000 02003b27 671c5370 5d100000 010036ef 5a180000 02002a4f 671c5370 5d100000 02003b2f
1213220  671c5370 54f849a8 228c0000 28c40062 000c4c78 5d7c0000 02003b1f 671c5370 5d100000 02003b27 671c5370 5d100000
1213300  010036ff 5a180000 02002a4f 671c5370 5d100000 02003b2f 68405370 54f84ac4 00109314 99e4000e aab40000 aa349db0
1213360  ad64723c 37883174 4a7c000c 723c0000 28c40086 000c4d00 5d7c0000 02003b1f 61605b58 02003b27 67505370 5d7c0000
1213440  010036ef 5a180000 02002a4f 67505370 5d7c0000 02003b2f 67505370 5d100000 02003b37 67ec0018 5a180000 02003b27
1213520  671c5370 5d100000 010036ef 5a180000 02002a4f 671c5370 5d100000 02003b2f 671c5370 54f85c30 03003b3f 6c840018
1213600  6bb46b74 228c0000 28c4006a 000c4d6c 5d7c0000 02003b1f 671c5370 5d100000 02003b27 671c5370 5d100000 010036ef
1213660  5a180000 02002a4f 61605b58 02003b2f 67505370 5d100000 020036e7 671c5370 5d100000 02003b2f 671c5370 54f85c30
1213740  03003b3f 4b8c0000 000036e7 6bb46b74 228c0000 28c40076 000c4de4 5d7c0000 02003b1f 671c5370 5d100000 02003b27
1214020  61605b58 010036ef 5a180000 02002a4f 67505370 5d7c0000 02003b2f 67505370 5d100000 020036ef 671c5370 5d100000
1214100  02002a4f 671c5370 5d100000 02003b2f 671c5370 54f85c30 03003b3f 4b8c0000 000036ef 6bb46b74 228c0000 28c40076
1214160  000c8b14 5d7c0000 02003b1f 671c5370 5d100000 02003b27 61605b58 010036ef 5a180000 02002a4f 67505370 5d7c0000
1214240  02003b2f 67505370 5d100000 020036ff 671c5370 5d100000 02002a4f 671c5370 5d100000 02003b2f 671c5370 54f85c30
1214320  03003b3f 4b8c0000 000036ff 6bb46b74 228c0000 000c4f20 00000038 b27cb66c 00000200 00000239 000c4f24 02000ce5
1214400  05001b0d 00003b47 00000013 00002c07 00644a23 0000026b 00002aff 29380038 000c4ecc 5d100000 02003b27 671c5370
1214460  5d100000 010036ef 5a180000 02002a4f 671c5370 5d100000 02003b2f 671c5370 48f8228c 28c40050 000bff98 5d100000
1214540  02003b27 671c5370 5d100000 010036ff 5a180000 02002a4f 671c5370 5d100000 02003b2f 68405370 46d89314 99e4000e
1214620  aab40000 aa349db0 af34723c 37884a7c 000c723c 000c4fc4 00000038 b27cb66c 00000201 0000023a 000c4fc8 02000ce5
1214700  05001b0d 00003b4f 0000000b 00002c07 00645da3 0000026b 00002aff 2c78006a 0002438a 45b82ba0 0010000c 37744c70
1214760  0000343f 723c2c30 000e3774 4e1c0000 000033bf 723c2c30 000e3774 4e1c0000 000034af 723c2c30 000e3774 4e1c0000
1215040  0000344f 723c2c58 2e7cac08 2ba00010 001237dc 4e700000 000034c7 a8582e98 c5a82c58 723c0000 000c5070 00000038
1215120  b27cb66c 00000202 0000023b 000c5074 02000ce5 05001b0d 00003b57 00000023 00002c07 00645fe3 0000026b 00002aff
1215200  2c780074 0002438a 45dc46ec 476847a8 2e7cac08 2ba0001c 000e37f0 4a940018 a8582e98 723c2c58 3c480000 00080d0c
1215260  001842ac 00003ad7 00080d0c 00183a4c 00080d0c 001442ac 00003b5f 00080d0c 001439f8 00080d0c 001042ac 00003ad7
1215340  00080d0c 001039a4 00080d0c 000c234c 0007fd0c 000c5174 00000070 b27cb66c 00000203 0000023c 000c50ac 02000ce5
1215420  05001b0d 00003b67 0000000b 00002c07 00646203 0000026b 00002aff 000c5174 00000038 b27cb66c 00000204 0000023d
1215500  000c5178 02000ce5 05001b0d 00003b6f 0000000b 00002c07 006468c3 0000026b 00002aff 2c780094 0002438a 45b82ba0
1215560  0010001a 32600018 32443844 42540000 00003b7f 31f0234c 000c8d48 2c30001a 32600018 32443844 42540000 00003b87
1215640  31f0234c 000c8d48 2c30001a 32600018 32443844 42540000 00003b8f 31f0234c 000c8d48 2c30001a 32600018 32443844
1215720  42540000 00003b97 31f0234c 000c8d48 2c583260 00183244 384441e8 00003b9f 31f0234c 000c8d48 000c52e4 00000038
1216000  b27cb66c 00000205 0000023e 000c52e8 02000ce5 05001b0d 00003ba7 00000013 00002c07 00646fe3 0000026b 00002aff
1216060  2c7800d8 0002438a 45c446d8 2ba0001c 002432d4 24d00000 000c652c 001c3260 00183244 384441e8 00003baf 3d18234c
1216140  000c8d48 2c30001e 32600018 32443844 42540000 00003bb7 31f046ac 242c0000 000c8d48 2c30001a 32600018 32443844
1216220  42540000 00003bbf 31f0234c 000c8d48 2c30001a 32600018 32443844 42540000 00003bc7 31f0234c 000c8d48 2c300026
```

| | | | | | | | | | | | | |
|---|---|---|---|---|---|---|---|---|---|---|---|---|
| 1216300 | 334831f0 | 46ac247c | 000c6769 | 00183260 | 00183244 | 384441e9 | 00003bcf | 3d0c234c | 000c8d48 | 2c5837f0 | 44c40000 | 020034bf |
| 1216360 | 6d0c5fa0 | 447c0000 | 02003ac7 | 5fa06bf4 | 242c0000 | 000c8e2c | 00000030 | 0009f010 | b27cb66c | 00000207 | 7fffffff | 000c52b8 |
| 1216440 | 02000ce5 | 03002c3d | 000031ff | 00000c83 | 00002d4f | 00002aff | 00000030 | 000c5288 | b27cb66c | 00000209 | 7fffffff | 0006f465 |
| 1216520 | 02000ce5 | 03002c3d | 00003207 | 00000963 | 00002d2f | 00002aff | 000c5384 | 00000038 | b27cb66c | 0000020a | 0000023f | 000c5388 |
| 1216600 | 02000ce5 | 05001b0d | 000031ff | 0000001b | 00002c07 | 00647303 | 0000026b | 00002aff | 28c40030 | 000c5348 | 45d04740 | a874aab4 |
| 1216660 | 0001a484 | a874aaf0 | ffffac4c | 33bc3a4c | 000c8e60 | 0018aa50 | aa349de0 | af34723c | 29540036 | 0002438a | 45d04740 | a874aab4 |
| 1216740 | 0000a354 | a874aaf0 | 0001ac4c | 33bc3a4c | 000c8e60 | 0018aab4 | 0001aa50 | 9e0caa34 | 9de0af34 | 723c0000 | 000c5544 | 00000128 |
| 1217020 | b27cb66c | 0000020b | 00000240 | 000c53c0 | 02000ce5 | 05001b0d | 000031ff | 00000013 | 00002c07 | 006475c3 | 0000026b | 00002aff |
| 1217100 | 000c53f4 | 00000038 | b27cb66c | 0000020c | 00000241 | 000c5478 | 02000ce5 | 05001b0d | 00003bdf | 0000001b | 00002c07 | 006479a3 |
| 1217160 | 0000026b | 00002aff | 000c542c | 00000038 | b27cb66c | 00000220 | 00000255 | 000b0fb0 | 02000ce5 | 05001b0d | 00003cf7 | 0000001b |
| 1217240 | 00002c07 | 0064db23 | 0000026b | 00002aff | 000c5474 | 00000048 | 000c9938 | 00000000 | 00000000 | 000c87b0 | 000b7615 | 000c8830 |
| 1217320 | 000c889c | 00000000 | 00000000 | 00000000 | 00000000 | 000bda39 | 000c8f74 | 000c8fb4 | 000c90e5 | 000c9125 | 000c5544 | 00000038 |
| 1217400 | b27cb66c | 0000020d | 00000242 | 000c5548 | 02000ce5 | 05001b0d | 00003be7 | 00000023 | 00002c07 | 00647b23 | 0000026b | 00002aff |
| 1217460 | 27f00098 | 000c8fa4 | 45b85758 | 6af00028 | 6a00477c | 47d0aa88 | 0028aab4 | 0060a4bc | 0022aa88 | 0028aab4 | 0067a38c | 00163380 |
| 1217540 | 001c3c9c | 00000028 | 000c8f94 | 002c2c88 | 00164550 | 6e580028 | 537032f0 | 001c247c | 0007fccc | 00283380 | 002439f8 | 0007f84c |
| 1217620 | 00283e70 | 002443c0 | 02003207 | 6af00020 | 6d0c247c | 000c8eb8 | 0024aa88 | 0020aa88 | 001c9de0 | ac09aa6c | a8589d88 | ac9038d4 |
| 1217700 | 24100000 | 000c8f64 | 000c55e8 | 00000070 | b27cb66c | 0000020e | 00000243 | 000c5580 | 02000ce5 | 05001b0d | 00003bef | 00000013 |
| 1217760 | 03002c07 | 00647ca3 | 0000026b | 00002aff | 000c55e8 | 00000038 | b27cb66c | 0000020f | 00000244 | 000c55ec | 02000ce5 | 05001b0d |
| 1220040 | 00003bf7 | 0000001b | 00002c07 | 00648623 | 0000026b | 00002aff | 2c780034 | 0002438a | 45b83574 | 4768332c | 24d00000 | 0007fccc |
| 1220120 | 0018394c | 00184210 | 00000003 | 42680000 | fffffffb | 3d302340 | 000c90fc | 000c56bc | 00000038 | b27cb66c | 00000210 | 00000245 |
| 1220200 | 000c56c0 | 02000ce5 | 05001b0d | 00003bff | 0000002b | 00002c07 | 006487e3 | 0000026b | 00002aff | 27f0009c | 000c912c | 45b85758 |
| 1220260 | 6af00028 | 6a00477c | 47f8001c | 48480018 | aa880028 | aab40060 | a4bc0020 | aa880028 | aab40067 | a38c0014 | 33800020 | 3af40028 |
| 1220340 | 000c8f94 | 002c2c88 | 00164550 | 6e580028 | 537032f0 | 0020247c | 0007fccc | 00283818 | 447c0000 | 02003207 | 6af00024 | 6d0c247c |
| 1220420 | 000c8eb8 | 0028aa88 | 0024aa88 | 00209de0 | ac08aa88 | 001ca858 | 9d88acd4 | aa6caaf0 | ffffac90 | 394c0018 | 24100000 | 000c90fc |
| 1220500 | 000c5778 | 00000070 | b27cb66c | 00000211 | 00000246 | 000c56f8 | 02000ce5 | 05001b0d | 00003c07 | 00000013 | 00002c07 | 00648a63 |
| 1220560 | 0000026b | 00002aff | 000c5778 | 00000038 | b27cb66c | 00000212 | 00000247 | 000c577c | 02000ce5 | 05001b0d | 00003c0f | 00000013 |
| 1220640 | 00002c07 | 00648f63 | 0000026b | 00002aff | 2954004c | 0002438a | 56f8671c | 682c5758 | 6aa055f0 | 6af0001c | 55f06af0 | 00206a00 |
| 1220720 | 45506b74 | 537032b8 | 24d00000 | 0007fccc | 002438fc | 00203894 | 001c3818 | 40f40000 | 000c9270 | 00142330 | 000c91ec | 000c5804 |
| 1221000 | 00000038 | b27cb66c | 00000213 | 00000248 | 000c5808 | 02000ce5 | 05001b0d | 00003c1f | 00000013 | 00002c07 | 00649503 | 0000026b |
| 1221060 | 00002aff | 29540054 | 0002438a | 56f8671c | 682c5758 | 6aa055f0 | 6af0001c | 55f06af0 | 002055f0 | 6af00024 | 6a004550 | 6b745370 |
| 1221140 | 32b8247c | 0007fccc | 00283984 | 00180024 | 38fc0020 | 3894001c | 3818408c | 000c930c | 00142330 | 000c92a0 | 000c5bf4 | 00000070 |
| 1221220 | b27cb66c | 00000214 | 00000249 | 000c5840 | 02000ce5 | 05001b0d | 00003c17 | 00000023 | 00002c07 | 00649383 | 0000026b | 00002aff |
| 1221300 | 000c5bf4 | 00000038 | b27cb66c | 00000215 | 0000024a | 000c5bf8 | 02000ce5 | 05001b0d | 00003c27 | 0000002b | 00002c07 | 00649863 |
| 1221360 | 0000026b | 00002aff | 27f00032 | 000c58a4 | 4e1c0000 | 00000003 | 4e700000 | 00000003 | 4ec40000 | 00000003 | 4f180000 | 00000003 |
| 1221440 | 4dc00018 | 00000003 | 228c0000 | 28c40032 | 000c58d8 | 4e1c0000 | 0000000b | 4e700000 | 00000003 | 4ec40000 | 00000003 | 4f180000 |
| 1221520 | 00000003 | 4dc00018 | 0000000b | 228c0000 | 28c40032 | 000c590c | 4e1c0000 | 00000013 | 4e700000 | 00000003 | 4ec40000 | 00000003 |
| 1221600 | 4f180000 | 0000000b | 4dc00018 | 00000003 | 228c0000 | 28c40032 | 000c5940 | 4e1c0000 | 0000001b | 4e700000 | 00000003 | 4ec40000 |
| 1221660 | 00000003 | 4f180000 | 0000000b | 4dc00018 | 0000000b | 228c0000 | 28c40032 | 000c5974 | 4e1c0000 | 00000023 | 4e700000 | 00000003 |
| 1221740 | 4ec40000 | 0000000b | 4f180000 | 00000003 | 4dc00018 | 00000003 | 228c0000 | 28c40032 | 000c59a8 | 4e1c0000 | 0000002b | 4e700000 |
| 1222020 | 00000003 | 4ec40000 | 0000000b | 4f180000 | 00000003 | 4dc00018 | 0000000b | 228c0000 | 28c40032 | 000c59dc | 4e1c0000 | 00000033 |
| 1222100 | 4e700000 | 00000003 | 4ec40000 | 0000000b | 4f180000 | 0000000b | 4dc00018 | 00000003 | 228c0000 | 28c40032 | 000c5a10 | 4e1c0000 |
| 1222160 | 0000003b | 4e700000 | 00000003 | 4ec40000 | 0000000b | 4f180000 | 0000000b | 4dc00018 | 0000000b | 228c0000 | 28c40032 | 000c5a84 |
| 1222240 | 4e1c0000 | 00000043 | 4e700000 | 0000000b | 4ec40000 | 00000003 | 4f180000 | 00000003 | 4dc00018 | 00000003 | 228c0000 | 000c587c |
| 1222320 | 000c9505 | 000c58e4 | 000c5918 | 000c9441 | 000c94e1 | 000c94f5 | 000c59e8 | 000c5a1c | 000c5a90 | 00000000 | 000c5b2c | 00000000 |
| 1222400 | 00000000 | 00000000 | 000c5b60 | 28c40032 | 000c5ab8 | 4e1c0000 | 0000004b | 4e700000 | 0000000b | 4ec40000 | 00000003 | 4f180000 |
| 1222460 | 00000003 | 4dc00018 | 0000000b | 228c0000 | 28c40032 | 000c5aec | 4e1c0000 | 00001aa7 | 4e700000 | 0000000b | 4ec40000 | 00000003 |
| 1222540 | 4f180000 | 0000000b | 4dc00018 | 00000003 | 228c0000 | 28c40032 | 000c5b20 | 4e1c0000 | 00003c2f | 4e700000 | 0000000b | 4ec40000 |
| 1222620 | 00000003 | 4f180000 | 0000000b | 4dc00018 | 0000000b | 228c0000 | 28c40032 | 000c5b54 | 4e1c0000 | 00001c5f | 4e700000 | 0000000b |
| 1222700 | 4ec40000 | 0000000b | 4f180000 | 00000003 | 4dc00018 | 00000003 | 228c0000 | 28c40032 | 000c5b88 | 4e1c0000 | 00001dff | 4e700000 |
| 1222760 | 0000000b | 4ec40000 | 0000000b | 4f180000 | 00000003 | 4dc00018 | 0000000b | 228c0000 | 28c40032 | 000c5bbc | 4e1c0000 | 00003c37 |
| 1223040 | 4e700000 | 0000000b | 4ec40000 | 0000000b | 4f180000 | 0000000b | 4dc00018 | 00000003 | 228c0000 | 29540032 | 0002438a | 4e1c0000 |
| 1223120 | 00001f0f | 4e700000 | 0000000b | 4ec40000 | 0000000b | 4f180000 | 0000000b | 4dc00018 | 0000000b | 228c0000 | 000c5cd4 | 000000a8 |
| 1223200 | b27cb66c | 00000216 | 0000024b | 000c5c30 | 02000ce5 | 05001b0d | 00003c3f | 0000000b | 00002c07 | 0064a8e3 | 0000026b | 00002aff |
| 1223260 | 000c5c64 | 00000038 | b27cb66c | 00000217 | 0000024c | 000c5c68 | 02000ce5 | 05001b0d | 00003c47 | 00000013 | 00002c07 | 0064ac43 |
| 1223340 | 0000026b | 00002aff | 000c5cd4 | 00000038 | b27cb66c | 00000218 | 0000024d | 000c5cd8 | 02000ce5 | 05001b0d | 00003c47 | 0000001b |

| | | | | | | | | | | | | |
|---|---|---|---|---|---|---|---|---|---|---|---|---|
| 1223420 | 00002c07 | 0064aee3 | 0000026b | 00002aff | 28c40038 | 000c9654 | 56f8671c | 682c46ec | 57b86b74 | 6a502e7c | ae302ba0 | 001c0012 |
| 1223500 | 24d00000 | 000c951c | 001caa6c | 2e98c5a8 | 2c58231c | 000c95dc | 000c5df0 | 00000038 | b27cb66c | 00000219 | 0000024e | 000c5df4 |
| 1223560 | 02000ce5 | 05001b0d | 00003c4f | 0000001b | 00002c07 | 0064b763 | 0000026b | 00002aff | 27f0002a | 000c5d34 | 5d100000 | 02003c57 |
| 1223640 | 671c5370 | 5d100000 | 02003c5f | 671c5fa0 | 48f84d18 | 0000348f | 228c0000 | 28c4005c | 000c5d90 | 5d100000 | 02003c57 | 60cc5aec |
| 1223720 | 02003c5f | 671c5fa0 | 581867b0 | 53705c30 | 010034cf | 5a180000 | 0200351f | 66700018 | 48f857b8 | 4b8c0000 | 0000351f | 55f06750 |
| 1224000 | 55f0671c | 5370bfcc | a8c80018 | 9d04aed4 | a8ac9d04 | aec07220 | 2954005c | 0002438a | 5d100000 | 02003c57 | 60cc5aec | 02003c5f |
| 1224060 | 671c5fa0 | 581867b8 | 53705c30 | 010034cf | 5a180000 | 0200341f | 66700018 | 48f857b8 | 4b8c0000 | 0000341f | 55f06750 | 55f0671c |
| 1224140 | 5370bfcc | a8c80018 | 9d04aed4 | a8ac9d04 | aec07220 | 000c5e7c | 00000038 | b27cb66c | 0000021a | 0000024f | 000c5e80 | 02000ce5 |
| 1224220 | 05001b0d | 00003c67 | 00000013 | 00002c07 | 0064bd43 | 0000026b | 00002aff | 29540054 | 0002438a | 5d100000 | 05003c6f | 671c5fa0 |
| 1224300 | 684069b0 | 5fa056f8 | 671c6a50 | 57586750 | 6aa05b58 | 04003c77 | 6b746d80 | 61e839a4 | 000c96ec | 001c3818 | 447c0000 | 05003c6f |
| 1224360 | 6dc45fa0 | 64806d3c | 5fa0234c | 000c97a8 | 000c6204 | 00000070 | b27cb66c | 0000021b | 00000250 | 000c5eb8 | 02000ce5 | 05001b0d |
| 1224440 | 03003c7f | 00000013 | 00002c07 | 0064c323 | 0000026b | 00002aff | 000c6204 | 00000038 | b27cb66c | 0000021c | 00000251 | 000c6208 |
| 1224520 | 02000ce5 | 05001b0d | 00003c87 | 0000001b | 00002c07 | 0064c943 | 0000026b | 00002aff | 27f0004a | 000c5f34 | 5d7c0000 | 02003c8f |
| 1224600 | 60445bc4 | 06003c97 | 6b74671c | 4b8c0000 | 000021ef | 4b8c0000 | 0000348f | 4b8c0000 | 0000348f | 5a180000 | 01003c9f | 6b7492a8 |
| 1224660 | 9974a874 | 9304aec0 | 72200009 | 28c4004a | 000c5f80 | 5d7c0000 | 02003c8f | 671c4af8 | 0000265f | 5de80000 | 06003c97 | 6b744af8 |
| 1224740 | 0000265f | 4b8c0000 | 0000348f | 4b8c0000 | 0000348f | 4b8c0000 | 0000348f | 4b8c0000 | 0000348f | 228c0000 | 28c400b2 | 000c6034 |
| 1225020 | 5d7c0000 | 02003c8f | 675058e0 | 02003ca7 | 67b855f0 | 68405370 | 5de80000 | 06003c97 | 6bb46c34 | 6aa06af0 | 001c6af0 | 002069b0 |
| 1225100 | 35c84538 | 6a505370 | 45686af0 | 00246b74 | 45385fa0 | 6bf44408 | 03003abf | 6c346b74 | 5fa043c0 | 02003ac7 | 5fa06bf4 | 24d00000 |
| 1225160 | 000c9974 | 00242e7c | ac082ba0 | 0028001a | 382c0024 | 54a8a858 | 2e9837c4 | 00204c70 | 0000348f | 2c88000c | 2c5837c4 | 00244a7c |
| 1225240 | 00203894 | 001c3818 | 3bf40000 | 000c96ec | 0014aa34 | 9d04af34 | 723c0000 | 28c4013a | 000c6170 | 5d7c0000 | 02003c8f | 675058e0 |
| 1225320 | 02003cb7 | 67b858e0 | 010034cf | 687c0020 | 5de80000 | 06003c97 | 6bb46c34 | 6af00028 | 6af0002c | 6af00030 | 55f06af0 | 001c55f0 |
| 1225400 | 6a5055f0 | 69b05370 | 31bc318c | 35c84538 | 6af00024 | 53704568 | 6af00034 | 6b744538 | 5fa06bf4 | 44c40000 | 03003abf | 6c346b74 |
| 1225460 | 5fa043c0 | 02003ac7 | 5fa06bf4 | 24d00000 | 000c9974 | 00382e7c | ac082ba0 | 0038001a | 382c0034 | 54a8a858 | 2e9837c4 | 00304c70 |
| 1225540 | 0000348f | 2c88000c | 2c5837c4 | 00344a7c | 00303894 | 002c382c | 00283c9c | 00000024 | 000c96ec | 00242e7c | ac082ba0 | 00240026 |
| 1225620 | 382c0020 | 5d7c0000 | 0200351f | 6dd86d50 | bfcca858 | 2e9837c4 | 001c4c70 | 0000351f | 2c880036 | 2c582e7c | ac082ba0 | 00240026 |
| 1225700 | 382c0020 | 5d7c0000 | 0200341f | 6dd86d50 | bfcca858 | 2e9837c4 | 001c4c70 | 0000341f | 2c880006 | 2c58c5a8 | aa6c9d04 | af5caa34 |
| 1225760 | 9d04af34 | 723c0000 | 29540090 | 0002438a | 517c0000 | 02003c8f | 622c5bc4 | 06003c97 | 6bb46c34 | 68406a50 | 6aa04af8 | 0000348f |
| 1226040 | 35c84538 | 69b05370 | 45696af0 | 001c6b74 | 45385fa0 | 6bf44408 | 03003abf | 6c346b74 | 5fa043c0 | 02003ac7 | 5fa06bf4 | 24d00000 |
| 1226120 | 000c9974 | 00202e7c | ac082ba0 | 0020001a | 382c001c | 54a8a858 | 2e9837b0 | 4e1c0000 | 0000348f | 2c88000c | 2c5837c4 | 001c4a7c |
| 1226200 | 0018231c | 000c96ec | 000c63c8 | 00000078 | b27cb66c | 0000021d | 00000252 | 000c63cc | 02000ce5 | 05001b0d | 00003cbf | 00000023 |
| 1226260 | 00002c07 | 0064cd83 | 0000026b | 00002aff | 000c6314 | 00000040 | 00000000 | 00000000 | 000ca0c4 | 00000000 | 00000000 | 000ca150 |
| 1226340 | 000ca2a0 | 000b7615 | 00000000 | 00000000 | 000ca244 | 00000000 | 000c9fa8 | 00000000 | 27f00098 | 000b9998 | 5d100000 | 03003287 |
| 1226420 | 4b8c0000 | 000040af | 60cc56f8 | 671c5370 | 59186530 | 001c5c30 | 020031f7 | 65300020 | 5e540000 | 02003ff7 | 66700018 | 5c9c0020 |
| 1226500 | 02000887 | 6b7458e0 | 02003ff7 | 6c840018 | 6c345878 | 001c67ec | 001c5370 | 5c9c001c | 020031f7 | 66c00020 | 001c5ec0 | 00000020 |
| 1226560 | 02003fff | 6c840018 | 6c345ec0 | 0000001c | 02000887 | 6b7458e0 | 02003fff | 6c840018 | 6c3422bc | 000cfa2c | 2c780028 | 0002438a |
| 1226640 | 35c82520 | 437c3280 | 24d00000 | 000cc704 | 001041e8 | 000044ef | 3cf4234c | 000b0b9c | 2954008c | 0002438a | 45b85758 | 671c6a00 |
| 1226720 | 5d100000 | 03003c8f | 67506af0 | 00286af0 | 001c57b8 | 6af00024 | 6a5047e4 | 2e7cac08 | 2ba0002c | 00263894 | 002854f8 | a8582e98 |
| 1227000 | 44c40000 | 04003c77 | 6af00020 | 5f783aa0 | 000c9a04 | 002c2c88 | 00102c58 | 37c40028 | 31d40020 | 4a7c0020 | 38940024 | 44a00000 |
| 1227060 | 02003c8f | 6e1c0020 | 6e58001c | 3b4c0000 | 000c9928 | 001c2304 | 000c99b0 | 000c647c | 00000038 | b27cb66c | 0000021e | 00000253 |
| 1227140 | 000c6480 | 02000ce5 | 05001b0d | 00003ccf | 00000023 | 00002c07 | 0064d383 | 0000026b | 00002aff | 2c78007c | 0002438a | 37240018 |
| 1227220 | 5e540000 | 030033cf | 6c480018 | 685469b0 | 344c3640 | 36140018 | 24d00000 | 000c9aa0 | 00189314 | 9afc0012 | 379c4c70 | 000021ef |
| 1227300 | 37884a7c | 000c723c | 2e7cac08 | 2ba00018 | 001e37f0 | 5d7c0000 | 01003ce7 | 6d3cbfcc | a8582e98 | 379c4c70 | 000029e7 | 723c2c58 |
| 1227360 | 379c4c70 | 00001b97 | 3d004a7c | 000c723c | 000c677c | 0000006c | b27cb66c | 0000021f | 00000254 | 000c53f8 | 02000ce5 | 05001b0d |
| 1227440 | 00003cef | 00000023 | 00002c07 | 0064d703 | 0000026b | 00002aff | 000c677c | 00000034 | 00000000 | 00000000 | 00000000 | 00000000 |
| 1227520 | 00000000 | 00000000 | 00000000 | 00000000 | 00000000 | 00000000 | 00000000 | 000808bc | 03003a37 | 00002c07 | 0000000c | 000939e0 |
| 1227600 | 000b0d70 | 00030000 | 00000000 | 0012616e | 616c797a | 696e675f | 756e6974 | 5f6e756d | 00000000 | 000808dc | 01003a3f | 00002c07 |
| 1227660 | 00000004 | 000939e0 | 000b0da0 | 00030000 | 00000000 | 00000028 | 000c6544 | b130b66c | 00000744 | 7fffffff | 000f04c5 | 02000ce5 |
| 1227740 | 01003d3d | 0000000b | 00002aff | 0012666f | 756e645f | 6e6f5f73 | 656d6963 | 6f6c6f6e | 00000000 | ffffffff | 01003a47 | 00002c07 |
| 1230020 | 00000004 | 000939e0 | 0002438a | 00030000 | 00000000 | 00000028 | 000f4780 | b27cb66c | 00000692 | 7fffffff | 000c6634 | 02000ce5 |
| 1230100 | 01003a4d | 0000001b | 00002aff | ffffffff | 01003a4f | 00002c07 | 00000004 | 000939e0 | 000f0958 | 00030000 | 00000000 | 00000028 |
| 1230160 | 000c6634 | b27cb66c | 000006a5 | 7fffffff | 000f4418 | 02000ce5 | 01003a4d | 00000063 | 00002aff | ffffffff | 01003a57 | 00002c07 |
| 1230240 | 00000004 | 000939e0 | 000f0524 | 00030000 | 00000000 | 00000028 | 000c65a4 | b27cb66c | 0000069c | 7fffffff | 000c65ec | 02000ce5 |
| 1230320 | 01003a4d | 0000005b | 00002aff | 000804fc | 01003a5f | 00002c07 | 00000004 | 000939e0 | 000efa9c | 00030000 | 00000000 | 00000000 |
| 1230400 | 00000028 | b288b66c | 000001ea | 00000755 | 000efa9c | 02000ce5 | 01003a5d | 0000000c | 00002aff | 000f7375 | 6270726f | 675f6465 |
| 1230460 | 636c5f69 | 6e000000 | 0007e63c | 01003a67 | 00002c07 | 00000004 | 000939e0 | 000c66d8 | 00030000 | 00000000 | 00000028 | 000c66d8 |

| | | | | | | | | | | | | |
|---|---|---|---|---|---|---|---|---|---|---|---|---|
| 1230540 | b0f8b66c | 000001eb | 7fffffff | 000c66c1 | 02000ce5 | 01003a65 | 0000000c | 00002aff | 00156375 | 7272656e | 745f6d6f | 64756c65 |
| 1230620 | 5f707265 | 66697800 | ffffffff | 01003a6f | 00002c07 | 00000004 | 000939e0 | 000f15c8 | 00030000 | 00000000 | 000c6678 | 00000028 |
| 1230700 | b27cb66c | 00000743 | 00000754 | 000f4d88 | 02000ce5 | 01003a3d | 00000003 | 00002aff | ffffffff | 02003a77 | 00002c07 | 00000008 |
| 1230760 | 000939e0 | 000b0dcc | 00030000 | 00000000 | 000c6874 | 0000002c | b288b66c | 00000262 | 7fffffff | 000ca57c | 02000ce5 | 0100147d |
| 1231040 | 01002d65 | 0000000b | 00002aff | 002a2f68 | 6f6d652f | 6f736173 | 312f612f | 73726565 | 2f73656d | 616e7469 | 635f6368 | 65636b31 |
| 1231120 | 2f706163 | 6b616765 | 00627574 | 002d2f68 | 6f6d652f | 6f736173 | 312f612f | 73726565 | 2f73656d | 616e7469 | 635f6368 | 65636b31 |
| 1231200 | 2f706163 | 6b616765 | 2e706c00 | 0000002c | 000ca5d8 | b27cb66c | 00000264 | 7fffffff | 000c4540 | 02000ce5 | 0200293d | 00003e8f |
| 1231260 | 00000273 | 00002aff | 0000002c | 000ca504 | b27cb66c | 0000028d | 7fffffff | 0009f070 | 02000ce5 | 02001f6d | 00003e8f | 00002c07 |
| 1231340 | 00002aff | 000e6172 | 63685f64 | 65636c5f | 70617274 | 00000000 | 000c69ac | 0000002c | b27cb66c | 00000266 | 0000028c | 0009cbc1 |
| 1231420 | 02000ce5 | 02002385 | 00003e8f | 00002c07 | 00002aff | 000000e0 | 000e3e54 | b27cb66c | 00000267 | 7fffffff | 000c6b44 | 02000ce5 |
| 1231500 | 020031ed | 020031e5 | 00003e97 | 02000a3d | 02003645 | 000034af | 0000000c | 02000a3d | 02003645 | 00000010 | 00000014 | 02000a3d |
| 1231560 | 02003645 | 0000226f | 00000018 | 02000a3d | 0000083f | 02000a3d | 02000885 | 00003e9f | 0000001c | 02000a3d | 02000885 | 00003ea7 |
| 1231640 | 00000020 | 01002d65 | 03003ead | 00003eb7 | 00000012 | 00000024 | 020031f5 | 00003ebf | 02000a3d | 02000cdd | 00000026 | 01001b75 |
| 1231720 | 01003d3d | 0000000e | 02000a3d | 02000885 | 0000001e | 01003ebd | 00000026 | 02000885 | 00000022 | 02003ebd | 00000012 | 00000016 |
| 1232000 | 00002aff | 0000002c | 000c6984 | b4f0b4e4 | 00000266 | 7fffffff | 000cc58d | 00000000 | 00000001 | 000c68a4 | 0002438a | 000ca368 |
| 1232060 | 000c6bb8 | 00000064 | b27cb66c | 00000268 | 0000028e | 000c6bbc | 02000ce5 | 05001b0d | 00003e97 | 0000001b | 00002c07 | 00662d63 |
| 1232140 | 00000273 | 00002aff | 000c6bb8 | 0000002c | b4f0b4e4 | 00000267 | 7fffffff | 0007eaad | 00000000 | 00000000 | 000c7fc8 | 0002438a |
| 1232220 | 000ccae0 | 2c780130 | 0002438a | 5d100000 | 03003287 | 4b8c0000 | 00003e97 | 64205818 | 67ec001c | 55f0687c | 003455f0 | 6af00028 |
| 1232300 | 55f06af0 | 002055f0 | 6a505370 | 55f8671c | 53705aec | 020031f7 | 4b8c0000 | 00003ebf | 5a180000 | 02000a3f | 60cc5aec | 02000cdf |
| 1232360 | 6a0058e0 | 01001b77 | 5a180000 | 01003d3f | 671c5c30 | 02000a3f | 66700018 | 5c9c0018 | 02000887 | 6e580020 | 5a180000 | 01003ebf |
| 1232440 | 6d805c30 | 02000887 | 6dc458e0 | 02003ebf | 67b06af0 | 003036a4 | 4790001c | 35400018 | 00383678 | 001c35c8 | 43000000 | 000034af |
| 1232520 | 000cc5cc | 003c3540 | 0018002c | 3f680038 | 38940034 | 382c0030 | 3b4c0000 | 000cc5cc | 00303540 | 00180024 | 3f68002c | 38940028 |
| 1232600 | 320c42ac | 0000226f | 000cc5cc | 00282ecc | 33f43e70 | 00243c9c | 00000020 | 000cc5ec | 00203894 | 001c3d48 | 3bf40000 | 000cc60c |
| 1232660 | 00143858 | 37dc41d4 | 00003eb7 | 242c0000 | 000cc62c | 00000078 | 000c68a4 | b27cb66c | 00000269 | 7fffffff | 000c6c80 | 02000ce5 |
| 1232740 | 020031ed | 020031e5 | 00003e9f | 02000a3d | 02000885 | 00003ec7 | 0000000c | 02000885 | 00003ecf | 00000010 | 020031f5 | 01003ebd |
| 1233020 | 00000014 | 02000a3d | 02000885 | 0000000e | 01003ebd | 00000016 | 02000885 | 00000012 | 01003ebd | 00000016 | 00002aff | 000c6d38 |
| 1233100 | 00000038 | b27cb66c | 0000026a | 0000028f | 000c6d3c | 02000ce5 | 05001b0d | 00003e9f | 0000001b | 00002c07 | 00662f63 | 00000273 |
| 1233160 | 00002aff | 27f0008c | 000c6cb0 | 5d100000 | 03003287 | 4b8c0000 | 00003e9f | 60cc56f8 | 671c55f0 | 682c5370 | 581867b8 | 53705c30 |
| 1233240 | 020031f7 | 65300018 | 5e540000 | 01003ebf | 67b85ec0 | 00000018 | 02000a3f | 66c0001c | 00185ec0 | 0000001c | 02000887 | 6b7458e0 |
| 1233320 | 01003ebf | 6c345ec0 | 00000018 | 02000887 | 613c58e0 | 01003ebf | 6c344768 | 33bc247c | 000cc6a0 | 0018386c | 3d302340 | 000cc6c0 |
| 1233400 | 00000038 | 000c6b44 | b27cb66c | 0000026b | 7fffffff | 000c6ce8 | 02000ce5 | 020031ed | 020031e5 | 00003e9f | 00000007 | 01003ebd |
| 1233460 | 0000000c | 00002aff | 2954002e | 0002438a | 5d100000 | 03003287 | 4b8c0000 | 00003e9f | 537055f0 | 671c5370 | 5d100000 | 01003ebf |
| 1233540 | 5fa04960 | 228c6c6c | 00000054 | 000c6c80 | b27cb66c | 0000026c | 7fffffff | 000c6dc8 | 02000ce5 | 020031ed | 020031e5 | 00003ec7 |
| 1233620 | 02000885 | 00003ed7 | 0000000c | 020031f5 | 01003ebd | 00000010 | 02000885 | 0000000e | 01003ebd | 00000012 | 00002aff | 000c737c |
| 1233700 | 00000038 | b27cb66c | 00000261 | 00000290 | 000c7380 | 02000ce5 | 05001b0d | 00003ec7 | 0000001b | 00002c07 | 00663503 | 00000273 |
| 1233760 | 00002aff | 27f00054 | 000c6e14 | 5d100000 | 03003287 | 4b8c0000 | 00003ec7 | 60cc56f8 | 671c5370 | 581867b8 | 53705c30 | 020031f7 |
| 1234040 | 65300018 | 5e540000 | 01003ebf | 67b85ec0 | 00000018 | 02000887 | 6b7458e0 | 01003ebf | 6c3422bc | 000cc704 | 00000054 | 000c6ce8 |
| 1234120 | b27cb66c | 0000026e | 7fffffff | 000c6e70 | 02000ce5 | 020031ed | 020031e5 | 00003ec7 | 02000885 | 00003edf | 0000000c | 020031f5 |
| 1234200 | 01003ebd | 00000010 | 02000885 | 0000000e | 01003ebd | 00000012 | 00002aff | 28c40054 | 000c6ebc | 5d100000 | 03003287 | 4b8c0000 |
| 1234260 | 00003ec7 | 60cc56f8 | 671c5370 | 581867b8 | 53705c30 | 020031f7 | 65300018 | 5e540000 | 01003ebf | 67b85ec0 | 00000018 | 02000887 |
| 1234340 | 6b7458e0 | 01003ebf | 6c3422bc | 000cc74c | 00000054 | 000c6dc8 | b27cb66c | 0000026f | 7fffffff | 000c6f18 | 02000ce5 | 020031ed |
| 1234420 | 020031e5 | 00003ec7 | 02000885 | 00003ee7 | 0000000c | 020031f5 | 01003ebd | 00000010 | 02000885 | 0000000e | 01003ebd | 00000012 |
| 1234500 | 00002aff | 28c40054 | 000c6f64 | 5d100000 | 03003287 | 4b8c0000 | 00003ec7 | 60cc56f8 | 671c5370 | 581867b8 | 53705c30 | 020031f7 |
| 1234560 | 65300018 | 5e540000 | 01003ebf | 67b85ec0 | 00000018 | 02000887 | 6b7458e0 | 01003ebf | 6c3422bc | 000cc76c | 00000054 | 000c6e70 |
| 1234640 | b27cb66c | 00000270 | 7fffffff | 000c6fc0 | 02000ce5 | 020031ed | 020031e5 | 00003ec7 | 02000885 | 00003eef | 0000000c | 020031f5 |
| 1234720 | 01003ebd | 00000010 | 02000885 | 0000000e | 01003ebd | 00000012 | 00002aff | 28c40054 | 000c700c | 5d100000 | 03003287 | 4b8c0000 |
| 1235000 | 00003ec7 | 60cc56f8 | 671c5370 | 581867b8 | 53705c30 | 020031f7 | 65300018 | 5e540000 | 01003ebf | 67b85ec0 | 00000018 | 02000887 |
| 1235060 | 6b7458e0 | 01003ebf | 6c3422bc | 000cc79c | 00000054 | 000c6f18 | b27cb66c | 00000271 | 7fffffff | 000c7068 | 02000ce5 | 020031ed |
| 1235140 | 020031e5 | 00003ec7 | 02000885 | 00003ef7 | 0000000c | 020031f5 | 01003ebd | 00000010 | 02000885 | 0000000e | 01003ebd | 00000012 |
| 1235220 | 00002aff | 28c40054 | 000c70b4 | 5d100000 | 03003287 | 4b8c0000 | 00003ec7 | 60cc56f8 | 671c5370 | 581867b8 | 53705c30 | 020031f7 |
| 1235300 | 65300018 | 5e540000 | 01003ebf | 67b85ec0 | 00000018 | 02000887 | 6b7458e0 | 01003ebf | 6c3422bc | 000cc7ac | 00000054 | 000c6fc0 |
| 1235360 | b27cb66c | 00000272 | 7fffffff | 000c7110 | 02000ce5 | 020031ed | 020031e5 | 00003ec7 | 02000885 | 00003eff | 0000000c | 020031f5 |
| 1235440 | 01003ebd | 00000010 | 02000885 | 0000000e | 01003ebd | 00000012 | 00002aff | 28c40054 | 000c715c | 5d100000 | 03003287 | 4b8c0000 |
| 1235520 | 00003ec7 | 60cc56f8 | 671c5370 | 581867b8 | 53705c30 | 020031f7 | 65300018 | 5e540000 | 01003ebf | 67b85ec0 | 00000018 | 02000887 |
| 1235600 | 6b7458e0 | 01003ebf | 6c3422bc | 000cc7e0 | 00000054 | 000c7068 | b27cb66c | 00000273 | 7fffffff | 000c71b8 | 02000ce5 | 020031ed |

| | | | | | | | | | | | | |
|---|---|---|---|---|---|---|---|---|---|---|---|---|
| 1235660 | 020031e5 | 00003ec7 | 02000885 | 00003f07 | 0000000c | 020031f5 | 01003eb4 | 00000010 | 02000885 | 0000000e | 01003ebd | 00000012 |
| 1235740 | 00002aff | 28c40054 | 000c7204 | 5d100000 | 03003287 | 4b8c0000 | 00003ec7 | 60cc56f8 | 671c5370 | 581867b8 | 53705c30 | 020031f7 |
| 1236020 | 65300018 | 5e540000 | 01003ebf | 67b85ec0 | 00000018 | 02000887 | 6b7458e0 | 01003ebf | 6c3422bc | 000cc800 | 00000054 | 000c7110 |
| 1236100 | b27cb66c | 00000274 | 7fffffff | 000c7260 | 02000ce5 | 020031ed | 020031e5 | 00003ec7 | 02000885 | 00003f0f | 0000000c | 020031f5 |
| 1236160 | 01003ebd | 00000010 | 02000885 | 0000000e | 01003ebd | 00000012 | 00002aff | 28c40054 | 000c72ac | 5d100000 | 03003287 | 4b8c0000 |
| 1236240 | 00003ec7 | 60cc56f8 | 671c5370 | 581867b8 | 53705c30 | 020031f7 | 65300018 | 5e540000 | 01003ebf | 67b85ec0 | 00000018 | 02000887 |
| 1236320 | 6b7458e0 | 01003ebf | 6c3422bc | 000cc820 | 00000054 | 000c71b8 | b27cb66c | 00000275 | 7fffffff | 000c7308 | 02000ce5 | 020031ed |
| 1236400 | 020031e5 | 00003ec7 | 02000885 | 00003f17 | 0000000c | 020031f5 | 01003ebd | 00000010 | 02000885 | 0000000e | 01003ebd | 00000012 |
| 1236460 | 00002aff | 29540054 | 0002438a | 5d100000 | 03003287 | 4b8c0000 | 00003ec7 | 60cc56f8 | 671c5370 | 581867b8 | 53705c30 | 020031f7 |
| 1236540 | 65300018 | 5e540000 | 01003ebf | 67b85ec0 | 00000018 | 02000887 | 6b7458e0 | 01003ebf | 6c3422bc | 000cc840 | 00000078 | 000c7260 |
| 1236620 | b27cb66c | 00000276 | 7fffffff | 000c7444 | 02000ce5 | 020031ed | 020031e5 | 00003ecf | 02000a3d | 02000885 | 00003ec7 | 0000000c |
| 1236700 | 02000885 | 00003ecf | 00000010 | 020031f5 | 01003ebd | 00000014 | 02000a3d | 02000885 | 0000000e | 01003ebd | 00000016 | 02000885 |
| 1236760 | 00000012 | 01003ebd | 00000016 | 00002aff | 000c75a8 | 00000038 | b27cb66c | 00000277 | 00000291 | 000c75ac | 02000ce5 | 05001b0d |
| 1237040 | 00003ecf | 0000001b | 00002c07 | 00663603 | 00000273 | 00002aff | 27f0008c | 000c7474 | 5d100000 | 03003287 | 4b8c0000 | 00003ecf |
| 1237120 | 60cc56f8 | 671c55f0 | 682c5370 | 581867b8 | 53705c30 | 020031f7 | 65300018 | 5e540000 | 01003ebf | 67b85ec0 | 00000018 | 02000a3f |
| 1237200 | 66c0001c | 00185ec0 | 0000001c | 02000887 | 6b7458e0 | 01003ebf | 6c345ec0 | 00000018 | 02000887 | 6d3c58e0 | 01003ebf | 6c344768 |
| 1237260 | 33bc247c | 000cc6a0 | 0018386c | 3d302340 | 000cc6c0 | 00000039 | 000c7308 | b27cb66c | 00000278 | 7fffffff | 000c74ac | 02000ce5 |
| 1237340 | 020031ed | 020031e5 | 00003ecf | 00000007 | 01003ebd | 0000000c | 00002aff | 2954002e | 0002438a | 5d100000 | 03003287 | 4b8c0000 |
| 1237420 | 00003ecf | 537055f0 | 671c5370 | 5d100000 | 01003ebf | 5fa04960 | 228c4543 | 00000100 | 000c7444 | b27cb66c | 00000279 | 7fffffff |
| 1237500 | 000c7760 | 02000ce5 | 020031ed | 020031e5 | 00003f1f | 02000a3d | 02003645 | 000034af | 0000000c | 02000a3d | 02003645 | 000033e7 |
| 1237560 | 00000010 | 02000a3d | 02003645 | 00000014 | 00000018 | 02000a3d | 02003645 | 0000226f | 0000001c | 02000a3d | 02000885 | 00003f27 |
| 1237640 | 00000020 | 02000a3d | 02000885 | 00003ea7 | 00000024 | 01002d65 | 03003ead | 00003f2f | 00000016 | 00000028 | 020031f5 | 00003ebf |
| 1237720 | 02000a3d | 02000cdd | 0000002a | 01001b75 | 01003d3d | 0000000e | 02000a3d | 02000d0d | 02003f35 | 00000016 | 0000001a | 00002aff |
| 1240000 | 02000a3d | 02000885 | 00000022 | 01003ebd | 0000002a | 02000885 | 00000026 | 02003ebd | 00000016 | 0000001a | 00002aff | 000c77d4 |
| 1240060 | 00000038 | b27cb66c | 0000027a | 00000292 | 000c77d8 | 02000ce5 | 05001b0d | 00003f1f | 0000001b | 00002c07 | 00664503 | 00000273 |
| 1240140 | 00002aff | 2c78017c | 0002438a | 5d100000 | 03003287 | 4b8c0000 | 00003f1f | 64205818 | 67ec001c | 55f0687c | 003c55f0 | 6af00034 |
| 1240220 | 55f06af0 | 002855f0 | 6af00020 | 55f06a50 | 537056f8 | 671c5370 | 5d100000 | 020031f7 | 4b8c0000 | 00003ebf | 5a180000 | 02000a3f |
| 1240300 | 60cc5aec | 02000cdf | 6a0058e0 | 01001b77 | 5a180000 | 01003d3f | 671c5c30 | 02000a3f | 66700018 | 5c9c0018 | 02000d0f | 67ec0018 |
| 1240360 | 4b8c0000 | 00002aff | 5c9c0018 | 02003f37 | 67b06af0 | 00305c30 | 02000a3f | 66700018 | 5c9c0018 | 02000887 | 6e580020 | 5a180000 |
| 1240440 | 01003ebf | 6d805c30 | 02000887 | 6dc458e0 | 02003ebf | 6d3c6e58 | 003036a4 | 4790001c | 35400018 | 00403678 | 001c35c8 | 41000000 |
| 1240520 | 000034af | 000cc5cc | 00443540 | 00180038 | 3f680040 | 3894003c | 320c42ac | 000033e7 | 000cc5cc | 003c3540 | 0018002c | 3f680038 |
| 1240600 | 39940034 | 382c0030 | 3b4c0000 | 000cc5cc | 00303540 | 00180024 | 3f68002c | 38940028 | 320c42ac | 0000226f | 000cc5cc | 002833f4 |
| 1240660 | 3e700024 | 3af40020 | 000cc8e0 | 00203894 | 001c3448 | 3bf40000 | 000cc60c | 00143858 | 37dc41d4 | 00003f2f | 242c0000 | 000cc62c |
| 1240740 | 00000078 | 000c74ac | b27cb66c | 0000027b | 7fffffff | 000c789c | 02000ce5 | 020031ed | 020031e5 | 00003f27 | 02000a3d | 02000885 |
| 1241020 | 00003f3f | 0000000c | 02000885 | 00003f47 | 00000010 | 020031f5 | 01003ebd | 00000014 | 02000a3d | 02000885 | 0000000e | 01003ebd |
| 1241100 | 00000016 | 02000885 | 00000012 | 01003ebd | 00000016 | 00002aff | 000c7978 | 00000038 | b27cb66c | 0000027c | 00000293 | 000c797c |
| 1241160 | 02000ce5 | 05001b0d | 00003f27 | 0000001b | 00002c07 | 00664703 | 00000273 | 00002aff | 27f0008c | 000c78cc | 5d100000 | 03003287 |
| 1241240 | 4b8c0000 | 00003f27 | 60cc56f8 | 671c55f0 | 682c5370 | 581867b8 | 53705c30 | 020031f7 | 65300018 | 5e540000 | 01003ebf | 67b85ec0 |
| 1241320 | 00000018 | 02000a3f | 66c0001c | 00185ec0 | 0000001c | 02000887 | 6b7458e0 | 01003ebf | 6c345ec0 | 00000018 | 02000887 | 6d3c58e0 |
| 1241400 | 01003ebf | 6c344768 | 33bc247c | 000cc960 | 0018386c | 3d302340 | 000cc980 | 00000038 | 000c7760 | b27cb66c | 0000027d | 7fffffff |
| 1241460 | 000c7904 | 02000ce5 | 020031ed | 020031e5 | 00003f27 | 00000007 | 01003ebd | 0000000c | 00002aff | 2954002e | 0002438a | 5d100000 |
| 1241540 | 03003287 | 4b8c0000 | 00003f27 | 537055f0 | 671c5370 | 5d100000 | 01003ebf | 5fa04960 | 228c2729 | 00000078 | 000c789c | b27cb66c |
| 1241620 | 0000027e | 7fffffff | 000c7a4c | 02000ce5 | 020031ed | 020031e5 | 00003f3f | 02000a3d | 01002d65 | 02000a3d | 01002825 | 01003a65 |
| 1241700 | 0000000c | 01001b75 | 01003a65 | 00003f2f | 02000885 | 00003f4f | 00000010 | 020031f5 | 01003ebd | 00000014 | 02000885 | 00000012 |
| 1241760 | 01003ebd | 00000016 | 00002aff | 000c7e08 | 00000038 | b27cb66c | 0000027f | 00000294 | 000c7e0c | 02000ce5 | 05001b0d | 00003f3f |
| 1242040 | 0000001b | 00002c07 | 00664b03 | 00000273 | 00002aff | 27f00098 | 000c7a98 | 5d100000 | 03003287 | 4b8c0000 | 00003f3f | 64205818 |
| 1242120 | 682c5370 | 56f8671c | 53705aec | 020031f7 | 60cc5aec | 01003ebf | 671c5c30 | 02000887 | 6d3c58e0 | 01003ebf | 6b7446ec | 476843e4 |
| 1242200 | 01003a67 | 5fa043c0 | 02000cdf | 4b8c0000 | 00002c07 | 6bb4247c | 0008042c | 001843e4 | 01003a67 | 4b8c0000 | 00003f2f | 447c0000 |
| 1242260 | 02000cdf | 4b8c0000 | 00002c07 | 6bb4247c | 0007eb8c | 0018231c | 000cc9c8 | 00000054 | 000c7904 | b27cb66c | 00000280 | 7fffffff |
| 1242340 | 000c7af4 | 02000ce5 | 020031ed | 020031e5 | 00003f3f | 02000885 | 00003ee7 | 0000000c | 020031f5 | 01003ebd | 00000010 | 02000885 |
| 1242420 | 0000000e | 01003ebd | 00000012 | 00002aff | 28c40054 | 000c7b40 | 5d100000 | 03003287 | 4b8c0000 | 00003f3f | 60cc56f8 | 671c5370 |
| 1242500 | 581867b8 | 53705c30 | 020031f7 | 65300018 | 5e540000 | 01003ebf | 67b85ec0 | 00000018 | 02000887 | 6b7458e0 | 01003ebf | 6c3422bc |
| 1242560 | 000cc76c | 00000054 | 000c7a4c | b27cb66c | 00000281 | 7fffffff | 000c7b9c | 02000ce5 | 020031ed | 020031e5 | 00003f3f | 02000885 |
| 1242640 | 00003ed7 | 0000000c | 020031f5 | 01003ebd | 00000010 | 02000885 | 0000000e | 01003ebd | 00000012 | 00002aff | 28c40054 | 000c7be8 |
| 1242720 | 5d100000 | 03003287 | 4b8c0000 | 00003f3f | 60cc56f8 | 671c5370 | 581867b8 | 53705c30 | 020031f7 | 65300018 | 5e540000 | 01003ebf |

| | | | | | | | | | | | | |
|---|---|---|---|---|---|---|---|---|---|---|---|---|
| 1243000 | 67b85ec0 | 00000018 | 02000897 | 6b7458e0 | 01003ebf | 6c3422bc | 000cc704 | 00000054 | 000c7af4 | b27cb66c | 00000282 | 7fffffff |
| 1243060 | 000c7c44 | 02000ce5 | 020031ed | 020031e5 | 00003f3f | 02000885 | 00003edf | 0000000c | 020031f5 | 01003ebd | 00000010 | 02000885 |
| 1243140 | 0000000e | 01003ebd | 00000012 | 00002aff | 28c40054 | 000c7c90 | 51100000 | 03003287 | 4b8c0000 | 00003f3f | 60cc56f8 | 671c5370 |
| 1243220 | 581867b8 | 53705c30 | 020031f7 | 65300018 | 5e540000 | 01003ebf | 67b85ec0 | 00000019 | 02000887 | 6b7458e0 | 01003ebf | 6c3422bc |
| 1243300 | 000cc74c | 00000054 | 000c7b9c | b27cb66c | 00000283 | 7fffffff | 000c7cec | 02000ce5 | 020031ed | 020031e5 | 00003f3f | 02000885 |
| 1243360 | 00003eef | 0000000c | 020031f5 | 01003ebd | 00000010 | 02000885 | 0000000e | 01003ebd | 00000012 | 00002aff | 28c40054 | 000c7d38 |
| 1243440 | 5d100000 | 03003287 | 4b8c0000 | 00003f3f | 60cc56f8 | 671c5370 | 581867b8 | 53705c30 | 020031f7 | 65300018 | 5e540000 | 01003ebf |
| 1243520 | 67b85ec0 | 00000018 | 02000887 | 6b7458e0 | 01003ebf | 6c3422bc | 000cc78c | 00000054 | 000c7c44 | b27cb66c | 00000284 | 7fffffff |
| 1243600 | 000c7d94 | 02000ce5 | 020031ed | 020031e5 | 00003f3f | 02000885 | 00003f17 | 0000000c | 020031f5 | 01003ebd | 00000010 | 02000885 |
| 1243660 | 0000000e | 01003ebd | 00000012 | 00002aff | 29540054 | 0002438a | 5d100000 | 03003287 | 4b8c0000 | 00003f3f | 60cc56f8 | 671c5370 |
| 1243740 | 581867b8 | 53705c30 | 020031f7 | 65300018 | 5e540000 | 01003ebf | 67b85ec0 | 00000018 | 02000887 | 6b7458e0 | 01003ebf | 6c3422bc |
| 1244020 | 000cc840 | 00000078 | 000c7cec | b27cb66c | 00000285 | 7fffffff | 000c7ed0 | 02000ce5 | 020031ed | 020031e5 | 00003f47 | 02000a3d |
| 1244100 | 02000885 | 00003f3f | 0000000c | 02000885 | 00003f47 | 00000010 | 020031f5 | 01003ebd | 00000014 | 02000a3d | 02000885 | 0000000e |
| 1244160 | 01003ebd | 00000016 | 02000885 | 00000012 | 01003ebd | 00000016 | 00002aff | 000c7fc4 | 00000038 | b27cb66c | 00000286 | 00000295 |
| 1244240 | 000c7fc8 | 02000ce5 | 05001b0d | 00003f47 | 0000001b | 00002c07 | 00664c03 | 00000273 | 00002aff | 27f0008c | 000c7f00 | 5d100000 |
| 1244320 | 03003287 | 4b8c0000 | 00003f47 | 60cc56f8 | 671c55f0 | 682c5370 | 581867b8 | 53705c30 | 020031f7 | 65300018 | 5e540000 | 01003ebf |
| 1244400 | 67b85ec0 | 00000018 | 02000a3f | 66c0001c | 00185ec0 | 0000001c | 02000897 | 6b7458e0 | 01003ebf | 6c345ec0 | 00000018 | 02000887 |
| 1244460 | 613c58e0 | 01003ebf | 6c344768 | 33bc247c | 000cc960 | 0018386c | 31302340 | 000cc980 | 00000038 | 000c7d94 | b27cb66c | 00000287 |
| 1244540 | 7fffffff | 000c7f38 | 02000ce5 | 020031ed | 020031e5 | 00003f47 | 00000007 | 01003ebd | 0000000c | 00002aff | 2954002e | 0002438a |
| 1244620 | 5d100000 | 03003287 | 4b8c0000 | 00003f47 | 517055f0 | 671c5370 | 5d100000 | 01003ebf | 5fa04960 | 228c4d2c | 00000090 | 000c7ed0 |
| 1244700 | b27cb66c | 00000288 | 7fffffff | 000c80e4 | 02000ce5 | 020031ed | 020031e5 | 00003ea7 | 02000a3d | 02003645 | 00003437 | 0000000c |
| 1244760 | 02000a3d | 02003645 | 00000010 | 00000014 | 02000a3d | 0000083f | 02000a3d | 01002d65 | 01003b4d | 00000012 | 0100371d | 00000016 |
| 1245040 | 020031f5 | 02003ebd | 00000018 | 0000001c | 04003b55 | 0000001a | 00000012 | 0000001e | 00000016 | 00002aff | 000ca640 | 00000078 |
| 1245120 | b130b66c | 00000289 | 00000296 | 000c69e9 | 02000ce5 | 05001b0d | 00003ea7 | 0000001b | 00002c07 | 00663063 | 00000273 | 00002aff |
| 1245200 | 000c87f4 | 00000040 | 00000000 | 000ca255 | 000c901d | 00000000 | 00000000 | 000c92b0 | 000c97c9 | 000c9874 | 00000000 | 00000000 |
| 1245260 | 00000000 | 00000000 | 00000000 | 00000000 | 27f000a4 | 000c8134 | 51100000 | 03003287 | 4b8c0000 | 00003ea7 | 60cc56f8 | 671c55f0 |
| 1245340 | 687c0020 | 55f06a00 | 53705818 | 67b85370 | 5e540000 | 020031f7 | 6530001c | 5e540000 | 02003ebf | 66700018 | 5c9c001c | 04003b57 |
| 1245420 | 6c840018 | 6af0001c | 6c3469b0 | 36a4477c | 35400018 | 0024362c | 320c42ac | 00003437 | 000cc5cc | 00283500 | 00183f68 | 00243894 |
| 1245500 | 002037dc | 3af4001c | 000cc5cc | 00202ecc | 3af4001c | 000c8bb4 | 001c38e8 | 3d6c2330 | 000cc8c0 | 00000058 | 000c7f38 | b27cb66c |
| 1245560 | 0000028a | 7fffffff | 000ca670 | 02000ce5 | 020031ed | 020031e5 | 00003ea7 | 02000a3d | 02003645 | 00003437 | 0000000c | 02000a3d |
| 1245640 | 0000083f | 0100371d | 0000000e | 02003ebd | 00000010 | 00000014 | 00002aff | 2954005c | 0002438a | 5d100000 | 03003287 | 4b8c0000 |
| 1245720 | 00003ea7 | 60cc56f8 | 671c55f0 | 68405370 | 581867b8 | 53705c30 | 02003ebf | 5f8c36a4 | 477c3500 | 0018362c | 331042ac | 00003437 |
| 1246000 | 000cc5cc | 001c2ecc | 39e83d6c | 37f03cf4 | 242c0000 | 000cc8c0 | 00000154 | 000cc12c | b27cb66c | 000002bf | 7fffffff | 000c8540 |
| 1246060 | 02000ce5 | 020031ed | 020031e5 | 00003fdf | 02000a3d | 02003645 | 000034bf | 0000000c | 02000a3d | 02000885 | 00003fe7 | 00000010 |
| 1246140 | 02000a3d | 0000083f | 02000a3d | 010036d5 | 00000014 | 02000a3d | 02000885 | 00003fef | 00000018 | 02000a3d | 010036dd | 0000001c |
| 1246220 | 0100371d | 0000000e | 020031f5 | 01003ebd | 00000020 | 02000a3d | 02000885 | 00000012 | 01003ff5 | 00000024 | 02000a3d | 02000885 |
| 1246300 | 0000001a | 02003ffd | 00000022 | 00000028 | 02000a3d | 02000d0d | 02000a65 | 03003b0d | 00000022 | 00000026 | 0000002a | 02000a3d |
| 1246360 | 01002ced | 0000400f | 02000a3d | 01002ced | 00000026 | 02000a3d | 01002ced | 00004017 | 02000a3d | 01002ced | 0000000e | 02000a3d |
| 1246440 | 01002ced | 0000401f | 00002527 | 02000cdd | 00000022 | 01001b75 | 02003ac5 | 0000000e | 020034bd | 00000026 | 0000002a | 02000cdd |
| 1246520 | 00003d0f | 01001b75 | 030034bd | 00000022 | 00000026 | 0000002a | 00002aff | 28c40254 | 000b211c | 5d100000 | 03003287 | 4b8c0000 |
| 1246600 | 00003fdf | 60cc56f8 | 671c55f0 | 687c0034 | 55f06af0 | 002c55f0 | 6af00024 | 55f06af0 | 001c55f0 | 6a005370 | 581867b8 | 53705c30 |
| 1246660 | 020031f7 | 66700018 | 5c9c0018 | 01003ebf | 67ec001c | 5e540000 | 02000a3f | 66700018 | 5c9c0018 | 02000887 | 6e580034 | 5a180000 |
| 1246740 | 01003ff7 | 67ec0019 | 5e540000 | 02000a3f | 65300020 | 5e540000 | 02000887 | 6e580024 | 5a180000 | 02003fff | 6c84001c | 67b85ec0 |
| 1247020 | 00000020 | 02000a3f | 66c00024 | 00205ec0 | 00000024 | 02000d0f | 66c00028 | 00245ec0 | 00000028 | 02000a67 | 66c0002c | 00285ec0 |
| 1247100 | 0000002c | 03003b0f | 6c84001c | 6c840018 | 6c345ec0 | 00000028 | 02000a3f | 66c0002c | 00285ec0 | 0000002c | 01002cef | 4b8c0000 |
| 1247160 | 0000400f | 5c9c0028 | 02000a3f | 66c0002c | 00285ec0 | 0000002c | 01002cef | 6c840018 | 5c9c0028 | 02000a3f | 66c0002c | 00285ec0 |
| 1247240 | 0000002c | 01002cef | 4b8c0000 | 00004017 | 5c9c0028 | 02000a3f | 66c0002c | 00285ec0 | 0000002c | 01002cef | 69b05ec0 | 00000028 |
| 1247320 | 02000a3f | 67ec0028 | 4b8c0000 | 00002527 | 5c9c0028 | 01002cef | 4b8c0000 | 0000401f | 5c9c0024 | 02000cdf | 6c84001c | 5a180000 |
| 1247400 | 01001b77 | 5a180000 | 02003ac7 | 6d3c58e0 | 020034bf | 6c840018 | 6c345ec0 | 00000020 | 02000cdf | 4b8c0000 | 00003d0f | 5a180000 |
| 1247460 | 01001b77 | 5a180000 | 030034bf | 6c84001c | 6c840018 | 6c3436a4 | 477c3540 | 00180038 | 362c37dc | 43000000 | 000034bf | 000cc5cc |
| 1247540 | 003c3410 | 00303e70 | 00383c9c | 00000034 | 000cedf4 | 00342ecc | 34a00028 | 3eec0030 | 382c002c | 31f0247c | 000cf098 | 002c3410 |
| 1247620 | 00203e70 | 00283c9c | 00000024 | 000cf0b8 | 00243468 | 3eec0020 | 382c001c | 31f0247c | 000cf048 | 001c38e8 | 3d6c2330 | 000cc8c0 |
| 1247700 | 0000010c | 000c8198 | b27cb66c | 000002c0 | 7fffffff | 000b22e0 | 02000ce5 | 020031ed | 020031e5 | 00003fdf | 02000a3d | 02003645 |
| 1247760 | 000034bf | 0000000c | 02000a3d | 02000885 | 00003fe7 | 00000010 | 0100371d | 0000000e | 020031f5 | 01003ebd | 00000014 | 02000a3d |
| 1250040 | 02000885 | 00000012 | 01003ff5 | 00000018 | 02000a3d | 02000d0d | 02000a65 | 02000cdd | 00000016 | 02003ac5 | 0000001c | 020034bd |

| | | | | | | | | | | | | |
|---|---|---|---|---|---|---|---|---|---|---|---|---|
| 1250120 | 0000001a | 00000007 | 02000a3d | 01002ced | 0300400f | 02000a3d | 01002ced | 0000001a | 02000a3d | 01002ced | 00004017 | 02000a3d |
| 1250200 | 01002ced | 0000000e | 00002527 | 02000cdd | 00000016 | 01001b75 | 02003ac5 | 0000000e | 020034bd | 0000001a | 00000007 | 02000cdd |
| 1250260 | 00003d0f | 02001b75 | 00000016 | 020034bd | 0000001a | 00000007 | 00002aff | 27f00124 | 000c4350 | 5d100000 | 03003287 | 4b8c0000 |
| 1250340 | 000040a7 | 60cc56f8 | 671c55f0 | 686855f0 | 69b05370 | 58186530 | 001c5c30 | 020031f7 | 65300024 | 5e540000 | 02003ff7 | 67ec0018 |
| 1250420 | 55f06670 | 00205ec0 | 00000024 | 02000a3f | 66c00028 | 00245ec0 | 00000028 | 02000887 | 6e0858e0 | 02003ff7 | 6c840018 | 6c840020 |
| 1250500 | 5c9c0024 | 02000887 | 6d3c58e0 | 02003ff7 | 6c840018 | 6c345878 | 001c67ec | 001c5370 | 5c9c001c | 020031f7 | 66c00024 | 001c5ec0 |
| 1250560 | 00000024 | 02003fff | 6c840018 | 55f06c84 | 00206c34 | 5c9c001c | 02000a3f | 66c00024 | 001c5ec0 | 00000024 | 02000887 | 6e0858e0 |
| 1250640 | 02003fff | 6c840018 | 6c840020 | 5c9c001c | 02000887 | 6d3c58e0 | 02003fff | 6c840018 | 6c344768 | 34a0001c | 364035c8 | 31f0247c |
| 1250720 | 000cf990 | 002033bc | 3e70001c | 3c480000 | 000cf864 | 0018386c | 3d302340 | 000cf884 | 0012696e | 74657266 | 6163655f | 7661725f |
| 1251000 | 6465636c | 002d3e20 | 000d666f | 726d616c | 5f706172 | 616d7300 | ffffffff | 01003a9f | 00002c07 | 00000004 | 000c4634 | 000c4634 |
| 1251060 | 0001004d | 00000000 | 000b6664 | 65736967 | 6e61746f | 72000000 | 000b6173 | 73657274 | 61676169 | 6e008794 | ffffffff | 01003aa7 |
| 1251140 | 00002c07 | 00000004 | 000c46b8 | 000c46b8 | 0001004d | 00000000 | 000d6361 | 73655f73 | 746d745f | 616c7400 | 000c6661 | 696c6f72 |
| 1251220 | 61737365 | 72740088 | 0007e9fc | 01003aaf | 00002c07 | 00000004 | 000c4750 | 000c4750 | 0001004d | 00000000 | 000c7375 | 6270726f |
| 1251300 | 675f7370 | 65630000 | 03003287 | 29c88830 | 000cf13c | 000cbeb4 | 00176173 | 73657274 | 5f656163 | 685f7369 | 676e616c | 5f747970 |
| 1251360 | 65001c94 | 000b7369 | 676e616c | 5f747970 | 65003188 | 0007ea1c | 03003ab7 | 00002c07 | 0000000c | 000c88ac | 000c47ec | 0001004d |
| 1251440 | 00000000 | 03003287 | 29c80000 | 000cf1d8 | 000b2360 | 27f00016 | 000c47ec | 5de80000 | 03003abf | 53705f8c | 228c2020 | 00125265 |
| 1251520 | 64656669 | 6e696e67 | 20736967 | 6e616c20 | 00051b9c | 00146173 | 73657274 | 5f656163 | 685f7661 | 72696162 | 6c650000 | 000d7661 |
| 1251600 | 72696162 | 6c655f74 | 79706500 | ffffffff | 03003adf | 00002c07 | 0000000c | 000c8954 | 000c48fc | 0001004d | 00000000 | 03003287 |
| 1251660 | 29c80010 | 000d795c | 0009e86c | 000a2370 | 02003b47 | 00002c07 | 00000008 | 000c8b54 | 000bff98 | 0001004d | 00000000 | 27f00016 |
| 1251740 | 000c48fc | 5de80000 | 03003ae7 | 53705f8c | 228c3814 | 00145265 | 64656669 | 6e696e67 | 20766172 | 6961626c | 65200060 | 0008099c |
| 1252020 | 03003af7 | 00002c07 | 0000000c | 000c89a4 | 000c4a0c | 0001004d | 00000000 | 27f00016 | 000c4a0c | 5de80000 | 03001d6f | 53705f8c |
| 1252100 | 228c3168 | 00115265 | 64656669 | 6e696e67 | 20636f6e | 73742000 | 00146469 | 7374696e | 67756973 | 685f6675 | 6e637469 | 6f6e005a |
| 1252160 | ffffffff | 03003b07 | 00002c07 | 0000000c | 000c8a18 | 000c8a18 | 0001004d | 00000000 | 03003287 | 29c87f40 | 000d7458 | 000d34d4 |
| 1252240 | 2c780028 | 0002438a | 44e80000 | C300344f | 6b886bc8 | 5fa043e4 | 02003ac7 | 5fa06c34 | 239c0000 | 0007e68c | 00156469 | 7374696e |
| 1252320 | 67756973 | 685f7072 | 6f636564 | 75726500 | 000809fc | 03003b0f | 00002c07 | 0000000c | 000c8a88 | 000c8a88 | 0001004d | 00000000 |
| 1252400 | 000c6c65 | 67616c5f | 76616c75 | 65730000 | 2c780028 | 0002438a | 44e80000 | 020034bf | 6b886bc8 | 44a00000 | 02003ac7 | 5fa06c34 |
| 1252460 | 239c0000 | 0007e68c | 000c636f | 6d707574 | 655f6578 | 7072009c | 000b7369 | 6d706c65 | 5f657870 | 7200caac | 00080a1c | 04003b17 |
| 1252540 | 00002c07 | 00000010 | 000c4bcc | 000c8b14 | 0001004d | 00000000 | 03003287 | 29c80010 | 000df978 | 000dc56c | 00116d6f | 72655f73 |
| 1252620 | 696d706c | 655f6578 | 70727300 | 29540016 | 0002438a | 5e540000 | 02003b3f | 6b886bc8 | 228c3132 | 0013636f | 6d707574 | 655f7369 |
| 1252700 | 6d706c65 | 5f657870 | 72002020 | 03003287 | 29c83140 | 000cef90 | 000cbaf8 | 27f08b0c | 000bff98 | 2ca0859c | 00000000 | 00000001 |
| 1252760 | 000c4e94 | 000bff98 | 0002438a | 000c44d8 | 02003b27 | 29c83128 | 000bff38 | 000c4ea4 | 00176973 | 615f6d61 | 636f725f | 72657365 |
| 1253040 | 72766564 | 5f776f72 | 64001c94 | 00080afc | 01003b4f | 00002c07 | 00000004 | 000c4f54 | 000c4f54 | 0001004d | 00000000 | 03003287 |
| 1253120 | 29c88b9c | 000d5268 | 000d2edc | 00152064 | 6f657320 | 6e6f7420 | 6d617463 | 68207769 | 74682000 | 0007eb3c | 04003b57 | 00002c07 |
| 1253200 | 00000010 | 000c4ff8 | 000c4ff8 | 0001004d | 00000000 | 03003287 | 29c80000 | 000cee84 | 000cb3a8 | 00116973 | 615f7265 | 73657276 |
| 1253260 | 65645f77 | 6f726400 | ffffffff | 01003b67 | 00002c07 | 00000004 | 000c8c60 | 000c8c60 | 0001004d | 00000000 | 03003287 | 29c83114 |
| 1253340 | 000d4ec8 | 000d1e14 | 2c780028 | 0002438a | 25202e7c | ad642ba0 | 00100012 | 24d00000 | 000b4d6c | 0010aa18 | 2e98c5a8 | 2c58723c |
| 1253420 | 000f6675 | 6e637469 | 6f6e5f65 | 78697374 | 73001b9c | 000b6465 | 7369676e | 5f756e69 | 74008c5c | 00106675 | 6e636172 | 63686974 |
| 1253500 | 65637475 | 72650000 | 000b6675 | 6e637072 | 6f636573 | 73008c94 | 000f6675 | 6e637061 | 636b6167 | 65646563 | 6c001c94 | 000f6675 |
| 1253560 | 6e637061 | 636b6167 | 65626f64 | 790030fc | 000c6675 | 6e636675 | 6e637469 | 6f6e00fa | ffffffff | 01003b6f | 00002c07 | 00000004 |
| 1253640 | 000c50dc | 000c50dc | 00010044 | 00000000 | 03003287 | 29c8509c | 000d74c4 | 000d3730 | 0007eb9c | 05003b77 | 00002c07 | 00000014 |
| 1253720 | 000939e0 | 000f162c | 0003005c | 00000000 | 00107072 | 6f636564 | 7572655f | 65786973 | 74730094 | 00157072 | 6f636564 | 75726561 |
| 1254000 | 72636869 | 74656374 | 75726500 | 00107072 | 6f636564 | 75726570 | 726f6365 | 73730040 | 00127072 | 6f636564 | 75726570 | 726f6365 |
| 1254060 | 64757265 | 000c8d64 | 00117072 | 6f636564 | 75726566 | 756e6374 | 696f6e00 | 00147072 | 6f636564 | 75726570 | 61636b61 | 6765626f |
| 1254140 | 647900a7 | 000a6973 | 5f646566 | 696e6564 | 00052020 | 0007ec5c | 02003ba7 | 00002c07 | 00000008 | 000c51a8 | 000c51a8 | 0001004d |
| 1254220 | 00000000 | 03003287 | 29c88dc4 | 000ced20 | 000caf34 | ffffffff | 02003bd7 | 00002c07 | 00000008 | 000ed7a8 | 000e9818 | 0001005c |
| 1254300 | 00000000 | 00117061 | 636b6167 | 655f6465 | 636c5f70 | 61727400 | ffffffff | 030031ff | 00002c07 | 0000000c | 000c8e80 | 000c5348 |
| 1254360 | 0001004d | 00000000 | 03003287 | 29c8920c | 000d7a44 | 0009f998 | 27f00014 | 000c8e94 | 52300000 | 00000003 | 0000000b | 28c40014 |
| 1254440 | 000c5318 | 4e700000 | 0000000b | 4950228c | 000c8e50 | 020031ff | 00002c07 | 00000008 | 000c8ee0 | 000c8ee0 | 0001004d | 00000000 |
| 1254520 | 2c780018 | 0002438a | 5d100000 | 02003207 | 62c022bc | 000c8e60 | 2cac2c24 | 0002438a | 2ca0287c | 00000000 | 00000001 | 000c8ec8 |
| 1254600 | 000c8ec8 | 0002438a | 000c449c | 000c636f | 6e763264 | 6563696d | 616c00e0 | 000d636f | 6e763264 | 6563696d | 616c3100 | ffffffff |
| 1254660 | 03003bdf | 00002c07 | 0000000c | 000c4b8c | 000c4b8c | 0001004d | 00000000 | 000c7072 | 6f636573 | 735f7374 | 6d740000 | ffffffff |
| 1254740 | 04003be7 | 00002c07 | 00000010 | 000c54a8 | 000c8fa4 | 0001004d | 00000000 | 03003287 | 29c88f2c | 000cec70 | 000cad78 | 0007ecbc |
| 1255020 | 02003bef | 00002c07 | 00000008 | 000c8fdc | 000c8fdc | 0001004d | 00000000 | 2954000e | 0002438a | 54a849c8 | 228c09a8 | 03003287 |
| 1255100 | 29c81b9c | 000bdc60 | 000c8049 | 27f00018 | 000c9004 | 4e1c0000 | 0000030b | 52c40000 | 00000053 | 2cac0984 | 0002438a | 2ca08fb4 |
| 1255160 | 0000001c | 00000006 | 000c8fc4 | 000c909c | 0002438a | 000c907c | 000c9188 | 28c40019 | 000c1024 | 4e1c0000 | 00000313 | 52c40000 |

1255240 0000005b 000a0e24 00000000 28c40018 000c904c 4e1c0000 0000031b 52c40000 00000063 000d6663 6f6e7632 64656369
1255320 6d616c00 28c40018 000c9064 4e1c0000 00000323 52c40000 0000006b 28c40018 000c909c 4e1c0000 0000032b 52c40000
1255400 00000073 00000000 000c8fd0 000c9010 000c9030 000c9058 000c9070 000c90a8 00000000 29540018 0002438a 4e1c0000
1255460 00000333 52c40000 0000007b 00080bbc 03003bf7 00002c07 0000000c 000c55b0 000c55b0 0001004d 00000000 000a7061
1255540 636b6167 652e706c 00000000 00037374 72000000 ffffffff 05003bff 00002c07 00000014 000c561c 000c912c 0001004d
1255620 00000000 03003287 29c80000 000ca328 000c7e4c 00046675 6e630000 000d7d20 000be058 29540010 0002438a 54a84a48
1255700 0018228c ffffffff 02003c07 00002c07 00000008 000c9190 000c9190 0001004d 00000000 00003f6f b3280000 000ca5dc
1255760 00000000 0002207b 00000000 000d7eb0 000be0c4 27f00014 000c91b4 4e1c0000 00000007 54a8228c 2cac287c 0002438a
1256040 2ca00fc8 00000000 00000001 000c917c 000c91b4 000c91be 000c9000 29540028 0002438a 56f86784 682c5758 671c6a00
1256120 45506bf4 5370247c 0007fccc 00142330 000c914c ffffffff 02003c0f 00002c07 00000008 000c9230 000c9230 0001004d
1256200 00000000 01003287 29c80000 000bfe9c 000c79bc 03003287 29c8afcd 000e6a94 000e34e8 27f00014 000c5728 4e1c0000
1256260 00000007 54a8228c 2cac1794 0002438a 2ca01b9c 00000000 00000001 000c921c 000c5728 000c5732 000c9254 000c9228
1256340 00046f74 6f620070 00080bdc 04003c17 00002c07 00000010 000c935c 000c935c 0001004d 00000000 000a6865 78737472
1256420 5f746f62 000c859c 00080bfc 02003c1f 00002c07 00000008 000c92d4 000c92d4 0001004d 00000000 000c206e 6f742064
1256500 6566696e 65640000 27f00014 000c57ac 4e1c0000 00000007 54a8228c 2cac7f1c 0002438a 2ca0859c 00000000 00000001
1256560 000c92c0 000c57ac 000c57b6 000c92f8 000c92cc 0007ecfc 05003c27 00002c07 00000014 000c949c 000c949c 0001004d
1256640 00000000 000c7375 6270726f 675f626f 64790000 0002223b 00000000 00040909 09740000 27f00020 000c9384 4e1c0000
1256720 00000003 519c0000 00000003 00000003 00000003 2cac9324 0002438a 2ca07f18 0000001c 00000008 000c933c 000c947c
1257000 0002438a 000c941c 00016200 28c40020 000c93ac 4e1c0000 0000000b 519c0000 00000003 00000003 0000000b 000c594c
1257060 00000000 28c40020 000c93dc 4e1c0000 00000013 519c0000 00000003 0000000b 00000003 03003287 29c89390 000ca3f4
1257140 000c7818 28c40020 000c93fc 4e1c0000 0000001b 519c0000 00000003 0000000b 0000000b 28c40020 000c943c 4e1c0000
1257220 00000023 519c0000 0000000b 00000003 00000003 000c9348 000c9390 000c93b8 000c93e8 000c9408 000c9448 000c9468
1257300 000c9488 28c40020 000c945c 4e1c0000 0000002b 519c0000 0000000b 00000003 0000000b 28c40020 000c947c 4e1c0000
1257360 00000033 519c0000 0000000b 0000000b 00000003 29540020 0002438a 4e1c0000 0000003b 519c0000 0000000b 0000000b
1257440 0000000b 2cac9464 0002438a 2ca07f18 0000003c 00000010 000c5870 000c5bbc 0002438a 000c5a44 00003f6f b3280000
1257520 000ca608 00000000 000c5ac4 000c93a4 000c5980 00000000 000c5af8 000c94d8 00016500 000c59b4 00000000 000c5b94
1257600 000c94ec 000c58b0 00000000 000c5bc8 000c94fc 00080c3c 010d3c3f 00002c07 00000004 000c953c 000c953c 0001004d
1257660 00000000 27f0000e 000c9564 56f85f8c 228c1c94 2cac9504 0002438a 2ca07f0c 00000000 00000001 000c952c 000c9564
1257740 000c9536 000c9560 000c9570 29540012 0002438a 4e1c0000 00000007 228c253a ffffffff 02003c47 00002c07 00000008
1260020 000c95b8 000c95b8 0001004d 00000000 000b7061 636b6167 65626f64 79000000 03003287 29c80010 000d7870 0009e028
1260100 2c780014 0002438a 36404368 239c0000 000c95dc 000c9578 03003c47 00002c07 0000000c 000c9614 000c9614 0001004d
1260160 00000000 27f00028 000c5c98 56f8682c 6a5046ec 477c39a4 000c951c 001c3880 45506dc4 6d502340 000c95dc 2cac2502
1260240 0002438a 2ca01ead 00000000 00000001 000c75ec 000c9670 000c9648 000c9638 000c9694 2b24859c 0002438a 000c5ca2
1260320 29c82500 000c963c 000c95f6 28c4001c 000c9670 4e1c0000 00000007 57586044 239c0000 000c95dc 29540016 0002438a
1260400 4e1c0000 00000007 54a854f8 228c0000 2b240000 0002438a 000c9680 00000007 29c80000 000c9688 000c9664 00176765
1260460 745f7479 70656d61 726b5f63 6f6e7374 7261696e 74000000 000d7375 62747970 655f696e 64696300 00097479 70655f6d
1260540 61726b00 ffffffff 03003c4f 00002c07 0000000c 000c971c 000c971c 0001004d 00000000 000c7061 636b6167 655f626f
1260620 64790000 00057374 6d747300 00042229 207b0000 2cac0000 0002438a 2ca00000 00000000 00000001 000c5d08 000c5d90
1260700 0002438a 000c9740 000c9750 2aa80000 000c9760 000c5d44 02003c57 29c80000 000c9744 000c5418 2b240000 0002438a
1260760 000c5da0 00126765 745f666f 726d616c 5f706172 616d7331 00000000 000e696e 74657266 6163655f 74797065 00000000
1261040 000a2508 02003c67 00002c07 00000008 000c97f0 000c97f0 0001004d 00000000 03003287 29c80000 000ca430 000c73c0
1261120 000c915c 000c901c 000a0f20 00000000 27f00018 000c5e24 5d100000 05003c6f 53705f64 54a8228c 2cac0000 0002438a
1261200 2ca00000 00000000 00000001 000c97d8 000c5e24 0002438a 000c9814 000c9830 0006666f 726d616c 00000000 2b240000
1261260 0002438a 000c5e34 05003c6f 29c80000 000c9824 000c97e8 00116765 745f666f 726d616c 5f706172 616d7300 ffffffff
1261340 02003c7f 00002c07 00000008 000c9898 000c9898 0001004d 00000000 03003287 29c80000 000d4f94 000d2320 27f00014
1261420 000c98c0 4e1c0000 00000007 54a8228c 2cac0000 0002438a 2ca00000 00000000 00000001 000c9884 000c98c0 000c98ca
1261500 000c98bc 000c9890 29540024 0002438a 56f8671c 682c5758 67506a00 24400000 000c97a8 00142330 000c9864 00126765
1261560 745f6163 7475616c 5f706172 616d7331 00000000 00056173 736f6300 00066163 7475616c 00000000 00047276 616c0000
1261640 00080c9c 03003c87 00002c07 0000000c 000c5ee8 000c6170 0001004d 00000000 000b7369 676e616c 5f646563 6c000000
1261720 0007696e 64657865 64000000 000b6973 5f646566 696e6564 31000000 ffffffff 02003caf 00002c07 00000008 000e9bb8
1262000 000e9c5c 0001005c 00000000 0005736c 69636500 00116765 745f6163 7475616c 5f706172 616d7300 ffffffff 04003cbf
1262060 00002c07 00000010 000c9940 000c6338 0001004d 00000000 000a636f 6e73745f 6465636c 00000000 27f0000e 000c6338
1262140 54a854f8 228c0000 00116765 745f6e74 695f6672 6f6d5f6c 69737400 0007ed7c 03003cc7 00002c07 0000000c 000ca2c8
1262220 000ca2c8 0001004d 00000000 001a6765 745f6174 74726962 7574656f 665f7072 6f636564 75726531 00000000 00186c62
1262300 735f7072 6f636564 7572655f 61747472 69627574 65730000 000c6174 74726962 7574655f 6f660000 0007edbc 04003ccf

```
1262360 00002c07 00000010 000c63fc 000c63fc 0001004d 00000000 000c7375 6270726f 675f6465 636c0000 0007e67c 04003cdf
1262440 00003cd7 00000010 000939e0 000939e0 00000000 00000000 001a6765 745f6174 74726962 7574656f 665f7072 6f636564
1262520 75726532 00000000 00080d1c 04003cef 00002c07 00000010 000c9b00 000c9b10 0001004d 00000000 03003287 29c80000
1262600 000ca514 000c6d7c 27f0000e 000c9b10 54f85548 228c0000 29540028 0002438a 45b846ec 57b86784 6a505818 67b86aa0
1262660 37f039a4 000c9a70 001c2304 000c9ae0 00196765 745f6174 74726962 7574656f 665f7072 6f636564 75726500 000aa9a8
1262740 03003cf7 00002c07 0000000c 000b0e9c 000b0e9c 0001004d 00000000 000c7375 62747970 655f6465 636c0000 00156173
1263020 73657274 5f656163 685f6174 74726962 75746500 0007eddc 02003cff 00002c07 00000008 000c9bcc 000b1078 0001004d
1263100 00000000 000c6765 6e657269 635f6c69 73740000 27f00018 000b0fe0 5d7c0000 04003cdf 5f8c5370 5fa0228c 00126765
1263160 745f7072 6f636564 7572655f 6465636c 00000000 00126c62 735f7072 6f636564 7572655f 6465636c 00000000 00080d5c
1263240 01003d07 00002c07 0000000c 000c9c64 000c9c64 0001004d 00000000 000b656c 7369665f 73746d74 73000000 ffffffff
1263320 030034bf 00003d0f 0000000c 000939e0 000939e0 00000000 00000000 2c780010 0002438a 239c0000 000c9c54 00116765
1263400 745f7072 6f636564 7572655f 616c6c00 000a7375 6270726f 6772616d 00000000 000e6361 6c6c696e 675f656e 74697479
1263460 00000000 00126c62 735f7072 6f636564 7572655f 63616c6c 00000000 000d7072 6f636564 75726563 616c6c00 000a7374
1263540 6172745f 6c696e65 00000000 0007e6fc 01003d17 00002c07 00000004 000c9d34 000c9d34 0001004d 00000000 03003287
1263620 29c80000 000ca544 000c6bfc 0007ee3c 04003d37 00003d2f 00000010 000939e0 000939e0 00000000 00000000 2cac0000
1263700 0002438a 2ca00000 00000000 00000001 000b1128 000b1128 0002438a 000c9d58 000b1134 00097772 6974655f 6c627300
1263760 00087772 6974656c 62730000 0007ee5c 01003d47 00002c07 00000004 000b1348 000b1348 0001004d 00000000 03003287
1264040 29c80000 000cca8c 000cabd4 0007e7bc 01003d4f 00002c07 00000004 000b13c4 000b13c4 0001004d 00000000 000c5355
1264120 425f424c 4f434b20 28220000 00140909 54595045 3a202250 524f4345 44555245 223b0000 000e0909 41545452 49425554
1264200 4553207b 00000000 000a7772 6974655f 61747472 00000000 00070909 09202020 7d000000 00120909 43414c4c 494e475f
1264260 454e5449 5459207b 00000000 00147772 6974655f 63616c6c 696e675f 656e7469 74790000 00192020 20202020 20202020
1264340 20202020 20202020 20202020 20207d00 000a0909 464f524d 414c207b 00000000 000d7772 6974655f 666f726d 616c7300
1264420 00112020 20202020 20202020 20202020 20207d00 000a0909 41435455 414c207b 00000000 000d7772 6974655f 61637475
1264500 616c7300 000c0909 5245534f 4c564544 207b0000 000e7772 6974655f 7265736f 6c766564 00000000 00132020 20202020
1264560 20202020 20202020 20202020 7d000000 03003287 29c80000 000d4f48 000d216c 0007e81c 01003d77 00002c07 00000004
1264640 000c9fcc 000c9fcc 0001004d 00000000 0007eedc 07003d8f 00002c07 0000001c 000b16cc 000b16cc 0001004d 00000000
1264720 0007ef1c 01003da7 00002c07 00000004 000ca0e8 000ca0e8 0001004d 00000000 0007ef7c 02003dbf 00002c07 00000008
1265000 000ca174 000ca174 0001004d 00000000 0007efdc 02003dcf 00002c07 00000008 000ca21c 000ca21c 0001004d 00000000
1265060 020031e7 b4640000 000c68a8 000ca55c 27f00012 000b15e8 4e1c0000 00000007 2edc0000 2cac0000 0002438a 2ca00000
1265140 00000000 00000001 000c9fb8 000b15e8 000b15f2 000c9ff0 000c9fc4 00070909 41545228 22000000 000c0909 09545950
1265220 4509093a 20220000 000d0909 0956414c 55450909 3a202200 000e0909 09454e54 49545909 093a2022 00000000 00130909
1265300 09415243 48495445 43545552 45093a20 22000000 00120909 09454e54 4954595f 54595045 093a2022 00000000 000c0909
1265360 0946494c 4509093a 20220000 00100909 09415243 485f4c49 4e45093a 20220000 00100909 0943414c 4c5f4c49 4e45093a
1265440 20220000 00130909 0950524f 43455353 5f4c494e 45093a20 22000000 03003287 29c88e70 000cee38 000cb22c 000c7061
1265520 636b6167 655f6465 636c0000 27f00012 000b1848 4e1c0000 00000007 2edc0000 2cac0000 0002438a 2ca00000 00000000
1265600 00000001 000ca0d4 000b1848 000b1852 000ca10c 000ca0e0 000e0909 09504152 414d4554 45522822 00000000 00100909
1265660 09434f4e 53545241 494e093a 20220000 00012000 00100909 09444952 45435449 4f4e093a 20220000 000b7061 636b6167
1265740 65646563 6c000000 27f00012 000b19fc 4e1c0000 00000007 2edc0000 2cac0000 0002438a 2ca00000 00000000 00000001
1266020 000ca160 000b19fc 000b1a06 000ca198 000ca16c 000f6765 745f6163 7475616c 5f6d6f64 65000000 000d0909 09534c49
1266100 43450909 3a202200 00130909 09464f52 4d414c5f 50415241 4d093a20 22000000 ffffffff 03003e67 00002c07 0000000c
1266160 000ca25c 000ca25c 0001004d 00000000 000c6372 6561745f 6d6f6475 6c650000 27f00012 000b1cd0 4e1c0000 00000007
1266240 2edc0000 2cac0000 0002438a 2ca00000 00000000 00000001 000ca208 000b1cd0 000b1cda 000ca240 000ca214 00003e8f
1266320 b3280000 000c683c 00000000 000c94c0 000c97d0 2cac0000 0002438a 2ca00000 00000000 00000001 000b2004 000b2034
1266400 0002438a 000ca280 000ca290 2b240000 0002438a 000b2044 06003c97 29c80000 000ca284 000b2014 00003e8f b3280000
1266460 000c6810 00000000 27f00018 000ca2f0 56f8571c 5fa04cc4 0000000b 4950228c 2cac0000 0002438a 2ca00000 00000000
1266540 00000000 000ca2b0 000ca2f0 000ca31c 000ca2ec 00000000 29540020 0002438a 56f85fa0 671cbfcc a874aaf0 ffffac4c
1266620 239c0000 000c9a04 2b240000 0002438a 000ca2fa 29c80000 000ca310 000ca2ba 2b24dc70 0002438a 000c7f10 000e6166
1266700 7465725f 656e645f 73746474 000c8e3c b464a32c 000c7ed4 000bdc6c 000f6368 65636b5f 73656d61 6e746963 7300a334
1266760 000c9fa8 000c9d04 b464a34c 000c7d98 000ca348 2b24a374 0002438a 000c7d48 b464a380 000c7cf0 000ca370 2aa8a38c
1267040 000ca37c 000c7ca0 b464a398 000c7c48 000ca388 2aa8a3a4 000ca394 000c7bf8 b464a3b0 000c7ba0 000ca3a0 2aa8a3bc
1267120 000ca3ac 000c7b50 b464a3c8 000c7af8 000ca3b8 b464fea0 000c7a50 000ca3d0 b464a3e0 000c7908 000ca3dc 2b24a3ec
1267200 0002438a 000c78dc b464a3f8 000c78a0 000ca3e8 b464a404 000c7764 000ca400 b464a410 000c74b0 000ca40c 00066572
1267260 725f6964 000ca430 2b24a428 0002438a 000c7484 b464a434 000c7448 000ca418 b464a440 000c730c 000ca43c 2b24a44c
1267340 0002438a 000c72bc b464a458 000c7264 000ca448 00067573 655f636c 000ca478 b464d560 000c71bc 000ca460 00096174
1267420 74725f73 70656300 2aa8a488 0009d55c 000c716c b464a494 000c7114 000ca478 00096174 74725f64 65636c00 2aa8a4ac
```

| | | | | | | | | | | | | |
|---|---|---|---|---|---|---|---|---|---|---|---|---|
| 1267500 | 000ca490 | 000c70c4 | b464a4b8 | 000c706c | 000ca49c | 2aa8a4c4 | 000ca4b4 | 000c701c | b464a4d0 | 000c6fc4 | 000ca4c0 | 2aa8a4dc |
| 1267560 | 000ca4cc | 000c6f74 | b464a4e4 | 000c6f1c | 000ca4d8 | 2aa8a4f4 | 000ca4e4 | 000c6ecc | b464a500 | 000c6e74 | 000ca4f0 | 2aa8a50c |
| 1267640 | 000ca4fc | 000c6e24 | b464a518 | 000c6dcc | 000ca508 | b464a524 | 000c6cec | 000ca520 | 00097479 | 70655f64 | 65636c00 | 2b24a53c |
| 1267720 | 0002438a | 000c6cc0 | b464a548 | 000c6c84 | 000ca52c | b464a554 | 000c6b48 | 000ca550 | 00096175 | 78666e73 | 2e706c00 | 00272f68 |
| 1270000 | 6f6d652f | 6f736173 | 312f612f | 73726565 | 2f73656d | 616e7469 | 635f6368 | 65636b31 | 2f617263 | 68002aff | 002a2f68 | 6f6d652f |
| 1270060 | 6f736173 | 312f612f | 73726565 | 2f73656d | 616e7469 | 635f6368 | 65636b31 | 2f617263 | 682e706c | 00090961 | 0000002c | 000ccb6c |
| 1270140 | b27cb66c | 00000299 | 7fffffff | 000c680c | 02000ce5 | 0200293d | 00003f6f | 0000027b | 00002aff | 0000002c | 000ccb98 | b27cb66c |
| 1270220 | 00000326 | 7fffffff | 000c6838 | 02000ce5 | 02001f6d | 00003f6f | 00002c07 | 00002aff | 00116d6f | 72655f63 | 6f6e7478 | 745f6974 |
| 1270300 | 656d7300 | 000ca824 | 0000002c | b27cb66c | 0000029b | 00000325 | 0009cbc1 | 02000ce5 | 02002385 | 00003f6f | 00002c07 | 00002aff |
| 1270360 | 000001b8 | 000c80e4 | b27cb66c | 0000029c | 7fffffff | 000cab5c | 02000ce5 | 020031ed | 020031e5 | 00003f77 | 02000a3d | 02003645 |
| 1270440 | 000033bf | 0000000c | 02000a3d | 02003645 | 00000010 | 00000014 | 02000a3d | 02003645 | 00003497 | 00000018 | 02000a3d | 02003645 |
| 1270520 | 0000001c | 00000020 | 02000a3d | 02003645 | 0000226f | 00000024 | 02000a3d | 02000885 | 00003f7f | 00000028 | 02000a3d | 02003645 |
| 1270600 | 000033d7 | 0000002c | 02000a3d | 02000885 | 00003f87 | 00000030 | 02000a3d | 02000885 | 00003ea7 | 00000034 | 01002d65 | 03003ead |
| 1270660 | 000033bf | 00000012 | 00000038 | 020031f5 | 00003ebf | 02000a3d | 01003a55 | 0000003c | 02000a3d | 02000cdd | 0000003a | 01001b75 |
| 1270740 | 01001f65 | 0000003e | 02000a3d | 02000cdd | 0000003a | 01001b75 | 01003d3d | 0000000e | 02000a3d | 02000cdd | 0000003a | 01001b75 |
| 1271020 | 0100343d | 0000001e | 02000a3d | 02000d0d | 02000a65 | 05003b75 | 00000040 | 0000343f | 0000001e | 00000044 | 00000048 | 00002aff |
| 1271100 | 02000a3d | 01002ced | 00003f8f | 02000a3d | 01002ced | 0000001e | 02000a3d | 01002ced | 00003f97 | 00002527 | 02000a3d | 02000885 |
| 1271160 | 0000002a | 01003ebd | 0000003a | 02000a3d | 02000885 | 00000032 | 01003ebd | 0000003a | 02000885 | 00000036 | 02003ebd | 00000012 |
| 1271240 | 00000016 | 00002aff | 000cab90 | 00000064 | b27cb66c | 0000029d | 00000327 | 000cab94 | 02000ce5 | 05001b0d | 00003f77 | 0000001b |
| 1271320 | 00002c07 | 00675763 | 0000027b | 00002aff | 000cab90 | 0000002c | b4f0b4e4 | 0000029c | 7fffffff | 0007eaad | 00000000 | 00000000 |
| 1271400 | 000c1870 | 0002438a | 000d07f4 | 2c7802d0 | 0002438a | 5d100000 | 03003287 | 4b8c0000 | 00003f77 | 64205818 | 67ec001c | 55f0687c |
| 1271460 | 005855f0 | 6af0004c | 55f06af0 | 004455f0 | 6af00038 | 55f06af0 | 003055f0 | 6af00028 | 55f06af0 | 002055f0 | 6a505370 | 56f8671c |
| 1271540 | 53705aec | 020031f7 | 4b8c0000 | 00003ebf | 5a180000 | 02000a3f | 64205c30 | 01003a57 | 67b85aec | 02000a3f | 65800018 | 5c9c0018 |
| 1271620 | 02000cdf | 6a0058e0 | 01001b77 | 5a180000 | 01001f67 | 6c345aec | 02000a3f | 60cc5aec | 02000cdf | 6d8058e0 | 01001b77 | 5a180000 |
| 1271700 | 01003d3f | 671c5c30 | 02000a3f | 66700018 | 5c9c0018 | 02000cdf | 6d8058e0 | 01001b77 | 5a180000 | 0100343f | 6af00040 | 5e540000 |
| 1271760 | 02000a3f | 66700018 | 5c9c0018 | 02000d0f | 66c00020 | 00185ec0 | 00000020 | 02000a67 | 67ec0020 | 4b8c0000 | 00002aff | 5c9c0020 |
| 1272040 | 05003b77 | 5fa04af8 | 0000343f | 6e580040 | 5f8c5ec0 | 00000018 | 02000a3f | 66c00020 | 00185ec0 | 00000020 | 01002cef | 4b8c0000 |
| 1272120 | 00003f8f | 5c9c0018 | 02000a3f | 66c00020 | 00185ec0 | 00000020 | 01002cef | 6e580040 | 5c9c0018 | 02000a3f | 67ec0018 | 4b8c0000 |
| 1272200 | 00002527 | 5c9c0018 | 01002cef | 4b8c0000 | 00003f97 | 5e540000 | 02000a3f | 66700018 | 5c9c0018 | 02000887 | 6e580030 | 5a180000 |
| 1272260 | 01003ebf | 6d805c30 | 02000a3f | 66700018 | 5c9c0018 | 02000887 | 6e580020 | 5a180000 | 01003ebf | 6d805c30 | 02000887 | 6dc458e0 |
| 1272340 | 02003ebf | 69b06af0 | 005436a4 | 4790001c | 35400018 | 005c3678 | 001c35c8 | 43000000 | 000033bf | 000cc5cc | 00603540 | 00180050 |
| 1272420 | 3f68005c | 38940058 | 382c0054 | 3b4c0000 | 000cc5cc | 00543540 | 00180048 | 3f680050 | 3894004c | 320c42ac | 00003497 | 000cc5cc |
| 1272500 | 004c3540 | 0018003c | 3f680048 | 38940044 | 320c3c9c | 00000040 | 000cc5cc | 00403540 | 00180034 | 3f68003c | 38940038 | 320c42ac |
| 1272560 | 0000226f | 000cc5cc | 00383410 | 002c3e70 | 00343c9c | 00000030 | 000ceb0c | 00303540 | 00180024 | 3f68002c | 38940028 | 320c42ac |
| 1272640 | 000033d7 | 000cc5cc | 002833f4 | 3e700024 | 3af40020 | 000ceb2c | 00203894 | 001c3d48 | 3bf40000 | 000cc60c | 00143858 | 37dc41d4 |
| 1272720 | 000033bf | 242c0000 | 000cc62c | 00000038 | 000ca670 | b27cb66c | 0000029e | 7fffffff | 000cabfc | 02000ce5 | 020031ed | 020031e5 |
| 1273000 | 00003f7f | 00000007 | 01003ebd | 0000000c | 00002aff | 000cad34 | 00000038 | b27cb66c | 0000029f | 00000328 | 000cad38 | 02000ce5 |
| 1273060 | 05001b0d | 00003f7f | 0000001b | 00002c07 | 00675863 | 0000027b | 00002aff | 27f0002e | 000cac6c | 5d100000 | 03003287 | 4b8c0000 |
| 1273140 | 00003f7f | 537055f0 | 671c5370 | 5d100000 | 01003ebf | 5fa04960 | 228c2879 | 00000078 | 000cab5c | b27cb66c | 000002a0 | 7fffffff |
| 1273220 | 000cad00 | 02000ce5 | 020031ed | 020031e5 | 00003f7f | 02000a3d | 02000885 | 00003f9f | 0000000c | 02000885 | 00003fa7 | 00000010 |
| 1273300 | 020031f5 | 01003ebd | 00000014 | 02000a3d | 02000885 | 0000000e | 01003ebd | 00000016 | 02000885 | 00000012 | 01003ebd | 00000016 |
| 1273360 | 00002aff | 2954008c | 0002438a | 5d100000 | 03003287 | 4b8c0000 | 00003f7f | 60cc56f8 | 671c55f0 | 682c5370 | 581867b8 | 53705c30 |
| 1273440 | 020031f7 | 65300018 | 5e540000 | 01003ebf | 67b85ec0 | 00000018 | 02000a3f | 66c0001c | 00185ec0 | 0000001c | 02000887 | 6b7458e0 |
| 1273520 | 01003ebf | 6c345ec0 | 00000018 | 02000887 | 6d3c58e0 | 01003ebf | 6c344768 | 33bc247c | 000cebac | 0018386c | 3d302340 | 000cebcc |
| 1273600 | 00000038. | 000cabfc | b27cb66c | 000002a1 | 7fffffff | 000cada0 | 02000ce5 | 020031ed | 020031e5 | 00003f87 | 00000007 | 01003ebd |
| 1273660 | 0000000c | 00002aff | 000caef0 | 00000038 | b27cb66c | 000002a2 | 00000329 | 000caef4 | 02000ce5 | 05001b0d | 00003f87 | 0000001b |
| 1273740 | 00002c07 | 00675963 | 0000027b | 00002aff | 27f0002e | 000cae10 | 5d100000 | 03003287 | 4b8c0000 | 00003f87 | 537055f0 | 671c5370 |
| 1274020 | 5d100000 | 01003ebf | 5fa04960 | 228c6574 | 00000078 | 000cad00 | b27cb66c | 000002a3 | 7fffffff | 000caea4 | 02000ce5 | 020031ed |
| 1274100 | 020031e5 | 00003f87 | 02000a3d | 02000885 | 00003faf | 0000000c | 02000885 | 00003fb7 | 00000010 | 020031f5 | 01003ebd | 00000014 |
| 1274160 | 02000a3d | 02000885 | 0000000e | 01003ebd | 00000016 | 02000885 | 00000012 | 01003ebd | 00000016 | 00002aff | 2954008c | 0002438a |
| 1274240 | 5d100000 | 03003287 | 4b8c0000 | 00003f87 | 60cc56f8 | 671c55f0 | 682c5370 | 581867b8 | 53705c30 | 020031f7 | 65300018 | 5e540000 |
| 1274320 | 01003ebf | 67b85ec0 | 00000018 | 02000a3f | 66c0001c | 00185ec0 | 0000001c | 02000887 | 6b7458e0 | 01003ebf | 6c345ec0 | 00000018 |
| 1274400 | 02000887 | 6d3c58e0 | 01003ebf | 6c344768 | 33bc247c | 000cec40 | 0018386c | 3d302340 | 000cec60 | 00000050 | 000cada0 | b27cb66c |
| 1274460 | 000002a4 | 7fffffff | 000caf7c | 02000ce5 | 020031ed | 020031e5 | 00003faf | 02000885 | 00003fbf | 0000000c | 020031f5 | 01003ebd |
| 1274540 | 00000010 | 02000885 | 0000000e | 00003ebf | 00002aff | 000cb1e8 | 00000038 | b27cb66c | 000002a5 | 0000032a | 000cb1ec | 02000ce5 |

```
1274620 05001b0d 00003faf 0000001b 00002c07 00676203 0000027b 00002aff 27f00050 000cafc8 5d100000 03003287 4b8c0000
1274700 00003faf 60cc56f8 671c5370 581867b8 53705c30 020031f7 66700018 5c9c0018 01003ebf 5fa05c30 02000887 6b744af8
1274760 00003ebf 239c0000 000cec98 00000054 000caea4 b27cb66c 000002a6 7fffffff 000cb024 02000ce5 020031ed 020031e5
1275040 00003faf 02000885 00003fc7 0000000c 020031f5 01003ebd 00000010 02000885 0000000e 01003ebd 00000012 00002aff
1275120 28c40054 000cb070 5d100000 03003287 4b8c0000 00003faf 60cc56f8 671c5370 581867b8 53705c30 020031f7 65300018
1275200 5e540000 01003ebf 67b85ec0 00000018 02000887 6b7458e0 01003ebf 6c3422bc 000ced10 00000054 000caf7c b27cb66c
1275260 000002a7 7fffffff 000cb0cc 02000ce5 020031ed 020031e5 00003faf 02000885 00003fcf 0000000c 020031f5 01003ebd
1275340 00000010 02000885 0000000e 01003ebd 00000012 00002aff 28c40054 000cb118 5d100000 03003287 4b8c0000 00003faf
1275420 60cc56f8 671c5370 581867b8 53705c30 020031f7 65300018 5e540000 01003ebf 67b85ec0 00000018 02000887 6b7458e0
1275500 01003ebf 6c3422bc 000ced68 00000054 000cb024 b27cb66c 000002a8 7fffffff 000cb174 02000ce5 020031ed 020031e5
1275560 00003faf 02000885 00003fd7 0000000c 020031f5 01003ebd 00000010 02000885 0000000e 01003ebd 00000012 00002aff
1275640 29540054 0002438a 5d100000 03003287 4b8c0000 00003faf 60cc56f8 671c5370 581867b8 53705c30 020031f7 65300018
1275720 5e540000 01003ebf 67b85ec0 00000018 02000887 6b7458e0 01003ebf 6c3422bc 000cedbc 00000078 000cb0cc b27cb66c
1276000 000002a9 7fffffff 000cb2b0 02000ce5 020031ed 020031e5 00003fb7 02000a3d 02000885 00003faf 0000000c 02000885
1276060 00003fb7 00000010 020031f5 01003ebd 00000014 02000a3d 02000885 0000000e 01003ebd 00000016 02000885 00000012
1276140 01003ebd 00000016 00002aff 000cb364 00000038 b27cb66c 000002aa 0000032b 000cb368 02000ce5 05001b0d 00003fb7
1276220 0000001b 00002c07 00676303 0000027b 00002aff 27f0008c 000cb2e0 5d100000 03003287 4b8c0000 00003fb7 60cc56f8
1276300 671c55f0 682c5370 581867b8 53705c30 020031f7 65300018 5e540000 01003ebf 67b85ec0 00000018 02000a3f 66c0001c
1276360 00185ec0 0000001c 02000887 6b7458e0 01003ebf 6c345ec0 00000018 02000887 613c58e0 01003ebf 6c344768 33bc247c
1276440 000cec40 0018386c 34302340 000cec60 00000038 000cb174 b27cb66c 000002ab 7fffffff 000cb318 02000ce5 020031ed
1276520 020031e5 00003fb7 00000007 01003ebd 0000000c 00002aff 2954002e 0002438a 5d100000 03003287 4b8c0000 00003fb7
1276600 537055f0 671c5370 5d100000 01003ebf 5fa04960 228c0000 00000050 000cb2b0 b27cb66c 000002ac 7fffffff 000cb3f0
1276660 02000ce5 020031ed 020031e5 00003f9f 02000885 00003eff 0000000c 020031f5 01003ebd 00000010 02000885 0000000e
1276740 00003ebf 00002aff 000cbab4 00000038 b27cb66c 000002ad 0000032c 000cbab8 02000ce5 05001b0d 00003f9f 0000001b
1277020 00002c07 00675d63 0000027b 00002aff 27f00050 000cb43c 5d100000 03003287 4b8c0000 00003f9f 60cc56f8 671c5370
1277100 581867b8 53705c30 020031f7 66700018 5c9c0018 01003ebf 5fa05c30 02000887 6b744af8 00003ebf 239c0000 000cc7e0
1277160 00000054 000cb318 b27cb66c 000002ae 7fffffff 000cb498 02000ce5 020031ed 020031e5 00003f9f 02000885 00003ef7
1277240 0000000c 020031f5 01003eb4 00000010 02000885 0000000e 01003ebd 00000012 00002aff 28c40054 000cb4e4 5d100000
1277320 03003287 4b8c0000 00003f9f 60cc56f8 671c5370 581867b8 53705c30 020031f7 65300018 5e540000 01003ebf 67b85ec0
1277400 00000018 02000887 6b7458e0 01003ebf 6c3422bc 000cc7ac 00000054 000cb3f0 b27cb66c 000002af 7fffffff 000cb540
1277460 02000ce5 020031ed 020031e5 00003f9f 02000885 00003ee7 0000000c 020031f5 01003ebd 00000010 02000885 0000000e
1277540 01003ebd 00000012 00002aff 28c40054 000cb5b0 5d100000 03003287 4b8c0000 00003f9f 60cc56f8 671c5370 581867b8
1277620 53705c30 020031f7 65300018 5e540000 01003ebf 67b85ec0 00000018 02000887 6b7458e0 01003ebf 6c3422bc 000cc76c
1277700 00000078 000cb498 b27cb66c 000002b0 7fffffff 000cb650 02000ce5 020031ed 020031e5 00003f9f 02000a34 01002d65
1277760 02000a3d 01002825 01003a65 0000000c 01001b75 01003a65 000033bf 02000895 00003f4f 00000010 020031f5 01003ebd
1300040 00000014 02000885 00000012 01003ebd 00000016 00002aff 28c40098 000cb69c 5d100000 03003287 4b8c0000 00003f9f
1300120 64205818 682c5370 56f8671c 53705aec 020031f7 60cc5aec 01003ebf 671c5c30 02000887 6d3c58e0 01003ebf 6b7446ec
1300200 476843e4 01003a67 5fa043c0 02000cdf 4b8c0000 00002c07 6bb4247c 0008042c 001843e4 01003a67 4b8c0000 000033bf
1300260 447c0000 02000cdf 4b8c0000 00002c07 6bb4247c 0007eb8c 0018231c 000cc9c8 00000054 000cb540 b27cb66c 000002b1
1300340 7fffffff 000cb6f8 02000ce5 020031ed 020031e5 00003f9f 02000885 00003ed7 0000000c 020031f5 01003ebd 00000010
1300420 02000885 0000000e 01003ebd 00000012 00002aff 28c40054 000cb744 5d100000 03003287 4b8c0000 00003f9f 60cc56f8
1300500 671c5370 581867b8 53705c30 020031f7 65300018 5e540000 01003ebf 67b85ec0 00000018 02000887 6b7458e0 01003ebf
1300560 6c3422bc 000cc704 00000054 000cb650 b27cb66c 000002b2 7fffffff 000cb7a0 02000ce5 020031ed 020031e5 00003f9f
1300640 02000885 00003edf 0000000c 020031f5 01003ebd 00000010 02000885 0000000e 01003ebd 00000012 00002aff 28c40054
1300720 000cb7ec 5d100000 03003287 4b8c0000 00003f9f 60cc56f8 671c5370 581867b8 53705c30 020031f7 65300018 5e540000
1301000 01003ebf 67b85ec0 00000018 02000887 6b7458e0 01003ebf 6c3422bc 000cc74c 00000054 000cb6f8 b27cb66c 000002b3
1301060 7fffffff 000cb848 02000ce5 020031ed 020031e5 00003f9f 02000885 00003eef 0000000c 020031f5 01003ebd 00000010
1301140 02000885 0000000e 01003ebd 00000012 00002aff 28c40054 000cb894 5d100000 03003287 4b8c0000 00003f9f 60cc56f8
1301220 671c5370 581867b8 53705c30 020031f7 65300018 5e540000 01003ebf 67b85ec0 00000018 02000887 6b7458e0 01003ebf
1301300 6c3422bc 000cc78c 00000054 000cb7a0 b27cb66c 000002b4 7fffffff 000cb8f0 02000ce5 020031ed 020031e5 00003f9f
1301360 02000885 00003f07 0000000c 020031f5 01003ebd 00000010 02000885 0000000e 01003ebd 00000012 00002aff 28c40054
1301440 000cb93c 5d100000 03003287 4b8c0000 00003f9f 60cc56f8 671c5370 581867b8 53705c30 020031f7 65300018 5e540000
1301520 01003ebf 67b85ec0 00000018 02000887 6b7458e0 01003ebf 6c3422bc 000cc800 00000054 000cb848 b27cb66c 000002b5
1301600 7fffffff 000cb998 02000ce5 020031ed 020031e5 00003f9f 02000885 00003f0f 0000000c 020031f5 01003ebd 00000010
1301660 02000885 0000000e 01003ebd 00000012 00002aff 28c40054 000cb9e4 5d100000 03003287 4b8c0000 00003f9f 60cc56f8
```

```
1301740 671c5370 581867b8 53705c30 020031f7 65300018 5e540000 01003ebf 67b85ec0 00000018 02000887 6b7458e0 01003ebf
1302020 6c3422bc 000cc820 00000054 000cb8f0 b27cb66c 000002b6 7fffffff 000cba40 02000ce5 020031ed 020031e5 00003f9f
1302100 02000885 00003f17 0000000c 020031f5 01003ebd 00000010 02000885 0000000e 01003ebd 00000012 00002aff 29540054
1302160 0002438a 5d100000 03003287 4b8c0000 00003f9f 60cc56f8 671c5370 581867b8 53705c30 020031f7 65300018 5e540000
1302240 01003ebf 67b85ec0 00000018 02000887 6b7458e0 01003ebf 6c3422bc 000cc840 00000078 000cb998 b27cb66c 000002b7
1302320 7fffffff 000cbb7c 02000ce5 020031ed 020031e5 00003fa7 02000a3d 02000885 00003f9f 0000000c 02000885 00003fa7
1302400 00000010 020031f5 01003ebd 00000014 02000a3d 02000885 0000000e 01003ebd 00000016 02000885 00000012 01003ebd
1302460 00000016 00002aff 000cbc34 00000038 b27cb66c 000002b8 0000032d 000cbc38 02000ce5 05001b0d 00003fa7 0000001b
1302540 00002c07 00675e63 0000027b 00002aff 27f0008c 000cbbac 5d100000 03003287 4b8c0000 00003fa7 60cc56f8 671c55f0
1302620 692c5370 581867b8 53705c30 020031f7 65300018 5e540000 01003ebf 67b85ec0 00000018 02000a3f 66c0001c 00185ec0
1302700 0000001c 02000887 6b7458e0 01003ebf 6c345ec0 00000018 02000887 6d3c58e0 01003ebf 6c344768 33bc247c 000cebac
1302760 0018386c 3d302340 000cebcc 00000038 000cba40 b27cb66c 000002b9 7fffffff 000cbbe4 02000ce5 020031ed 020031e5
1303040 00003fa7 00000007 01003ebd 0000000c 00002aff 2954002e 0002438a 5d100000 03003287 4b8c0000 00003fa7 537055f0
1303120 671c5370 5d100000 01003ebf 5fa04960 228c0000 00000054 000cbb7c b27cb66c 000002ba 7fffffff 000cbcc4 02000ce5
1303200 020031ed 020031e5 00003ee7 02000885 00003fdf 0000000c 020031f5 01003ebd 00000010 02000885 0000000e 01003ebd
1303260 00000012 00002aff 000cbe30 00000038 b27cb66c 000002bb 0000032e 000cbe34 02000ce5 05001b0d 00003ee7 0000001b
1303340 00002c07 00663b63 0000027b 00002aff 2c780054 0002438a 5d100000 03003287 4b8c0000 00003ee7 60cc56f8 671c5370
1303420 581867b8 53705c30 020031f7 65300018 5e540000 01003ebf 67b85ec0 00000018 02000887 6b7458e0 01003ebf 6c3422bc
1303500 000cefcc 00000170 000cbbe4 b27cb66c 000002bc 7fffffff 000cc12c 02000ce5 020031ed 020031e5 00003fdf 02000a3d
1303560 02003645 0000344f 0000000c 02000a3d 02000885 00003fe7 00000010 02000a3d 0000083f 02000a3d 010036d5 00000014
1303640 02000a3d 02000885 00003fef 00000018 02000a3d 010036dd 0000001c 02000a3d 02003645 000034ef 00000020 02000a3d
1303720 02000885 00003c5f 00000024 0100371d 0000000e 020031f5 01003ebd 00000028 02000a3d 02000885 00000012 01003ff5
1304000 0000002c 02000a3d 02000885 0000001a 02003ffd 0000002a 00000030 02000a3d 02000885 00000026 02004005 0000002a
1304060 00000034 02000d0d 02000a65 03003b05 0000002a 0000002e 00000032 02000a3d 01002ced 0000400f 02000a3d 01002ced
1304140 0000002e 02000a3d 01002ced 00004017 02000a3d 01002ced 0000000e 02000a3d 01002ced 0000401f 00002527 02000cdd
1304220 0000002a 01001b75 02003ac5 0000000e 0300344d 0000002e 00000032 00000036 00002aff 000cc4c8 00000078 b27cb66c
1304300 000002bd 0000032f 000b2320 02000ce5 05001b0d 00003fdf 0000001b 00002c07 00677e63 0000027b 00002aff 000cc4c8
1304360 00000040 00000000 000c8c50 000c9175 000c95a9 000c8d28 000cf3c0 00000000 000c920d 00000000 000c8a08 000bdb79
1304440 000cf4cc 000c9874 000c9c34 27f00280 000cc250 5d100000 03003287 4b8c0000 00003fdf 60cc56f8 671c55f0 687c0044
1304520 55f06af0 003c55f0 6af00034 55f06af0 002c55f0 6af00024 55f06af0 001c55f0 6a005370 581867b8 53705c30 020031f7
1304600 66700018 5c9c0018 01003ebf 67ec0020 5e540000 02000a3f 66700018 5c9c0018 02000887 6e580044 5a180000 01003ff7
1304660 67ec001c 5e540000 02000a3f 66700018 5c9c0018 02000887 6e580034 5a180000 02003fff 6c840020 67ec0018 5e540000
1304740 02000a3f 65300024 5e540000 02000887 6e58001c 5a180000 02004007 6c840020 67b85ec0 00000024 02000d0f 66c00028
1305020 00245ec0 00000028 02000a67 66c0002c 00285ec0 0000002c 03003b07 6c840020 6c84001c 6c840018 5c9c0028 02000a3f
1305100 66c0002c 00285ec0 0000002c 01002cef 4b8c0000 0000400f 5c9c0028 02000a3f 66c0002c 00285ec0 0000002c 01002cef
1305160 6c84001c 5c9c0028 02000a3f 66c0002c 00285ec0 0000002c 01002cef 4b8c0000 00004017 5c9c0028 02000a3f 66c0002c
1305240 00285ec0 0000002c 01002cef 69b05ec0 00000028 02000a3f 67ec0028 4b8c0000 00002527 5c9c0028 01002cef 4b8c0000
1305320 0000401f 5c9c0024 02000cdf 6c840020 5a180000 01001b77 5a180000 02003ac7 6d3c58e0 0300344f 6c84001c 6c840018
1305400 6c3436a4 477c3540 00180048 362c37dc 43000000 0000344f 000cc5cc 004c3410 00403e70 00483c9c 00000044 000cedf4
1305460 00442ecc 34a00038 3eec0040 382c003c 31f0247c 000cf098 003c3410 00303e70 00383c9c 00000034 000cf0b8 003434a0
1305540 00283eec 0030382c 002c31f0 24d00000 000cf0d8 002c3540 00180020 3f680028 38940024 320c42ac 000034ef 000cc5cc
1305620 002433d8 3e700020 31f4001c 000cf0f8 001c38e8 3d6c2330 000cc8c0 0000012c 000cbcc4 b27cb66c 000002be 7fffffff
1305700 000c8198 02000ce5 020031e1 020031e5 00003fdf 02000a3d 02003645 0000344f 0000000c 02000a3d 02000885 00003fe7
1305760 00000010 02000a3d 02003645 000034ef 00000014 02000a3d 02000885 00003c5f 00000018 0100371d 0000000e 020031f5
1306040 01003ebd 0000001c 02000a3d 02000885 00000012 01003ff5 00000020 02000a3d 02000885 0000001a 02004005 0000001e
1306120 00000024 02000d0d 02000a65 02000cdd 0000001e 02003ac5 00000028 0300344d 00000022 00000007 0000002c 02000a3d
1306200 01002ced 0000400f 02000a3d 01002ced 00000022 02000a3d 01002ced 00004017 02000a3d 01002ced 0000000e 00002527
1306260 02000cdd 0000001e 01001b75 02003ac5 0000000e 0300344d 00000022 00000007 00000026 00002aff 28c401f0 000c82e4
1306340 5d100000 03003287 4b8c0000 00003fdf 60cc56f8 671c55f0 687c002c 55f06af0 002455f0 6af0001c 55f06a00 53705818
1306420 67b85370 5e540000 020031f7 66700018 5c9c0018 01003ebf 67ec001c 5e540000 02000a3f 66700018 5c9c0018 02000887
1306500 6e58002c 5a180000 01003ff7 67ec0018 5e540000 02000a3f 65300020 5e540000 02000887 6e58001c 5a180000 02004007
1306560 6c84001c 67b85ec0 00000020 02000d0f 66c00024 00205ec0 00000024 02000a67 66c00028 00245ec0 00000028 02000cdf
1306640 6c84001c 5a180000 02003ac7 5fa058e0 0300344f 6c840018 53705fa0 5c9c0024 02000a3f 66c00028 00245ec0 00000028
1306720 01002cef 4b8c0000 0000400f 5c9c0024 02000a3f 66c00028 00245ec0 00000028 01002cef 6c840018 5c9c0024 02000a3f
1307000 66c00028 00245ec0 00000028 01002cef 4b8c0000 00004017 5c9c0024 02000a3f 67ec0024 4b8c0000 00002527 5c9c0024
```

```
1307060  01002cef 69b05ec0 00000020 02000cdf 6c84001c 5a180000 01001b77 5a180000 02003ac7 6d3c58e0 0300344f 6c840018
1307140  53706c34 36a4477c 35400018 0030362c 37dc42ac 0000344f 000cc5cc 00343410 00283e70 00303c9c 0000002c 000cedf4
1307220  002c3540 00180020 3f680028 38940024 320c42ac 000034ef 000cc5cc 002433d8 3e700020 3af4001c 000cf0f8 001c38e8
1307300  3d6c2330 000cc8c0 00000084 000c430c b27cb66c 000002ea 7fffffff 000cc504 02000ce5 020031ed 020031e5 000040af
1307360  02000885 000040bf 0000000c 02000a3d 020031f5 02003ff5 00000010 00000014 02000885 0000000e 02003ff5 00000012
1307440  00000016 020031f5 02003ffd 00000012 00000016 02000885 0000000e 02003ffd 00000012 00000016 00002aff 000ccad8
1307520  00000038 b27cb66c 000002eb 0000033d 000b9c20 02000ce5 05001b04 000040af 0000001b 00002c07 0067c863 0000027b
1307600  00002aff 0000007c 000cc448 b27cb66c 000002ec 7fffffff 000b9a40 02000ce5 020031ed 020031e5 000040af 000040c7
1307660  02000a3d 020031f5 02003ff5 0000000c 00000010 02000885 00000014 02003ff5 0000000e 00000012 020031f5 02003ffd
1307740  0000000e 00000012 02000885 00000016 02003ffd 0000000e 00000012 00002aff 000b9c5c 000b861c 020031ef 00002c07
1310020  00000008 000939e0 000c6984 00030000 00000000 ffffffff 03003e97 00002c07 0000000c 000cc63c 000cc63c 0001004e
1310100  00000000 0007e95c 05003647 00002c07 00000014 000e4b84 000e4b84 0001005a 00000000 ffffffff 03003e9f 00002c07
1310160  0000000c 000cc6d0 000cc6d0 0001004e 00000000 ffffffff 03003ea7 00002c07 0000000c 000cca28 000cca28 0001004e
1310240  00000000 ffffffff 03003eaf 00002c07 0000000c 000e94ac 000e94ac 0001005c 00000000 2cac0000 0002438a 2ca00000
1310320  00000000 00000001 000c5a0c 000c6a0c 0002438a 0009f094 00117061 636b6167 655f6465 636c5f69 74656d00 00176d6f
1310400  72655f70 61636b61 67655f64 65636c5f 6974656d 73000000 0007f1fc 03003ec7 00002c07 0000000c 000cc714 000cc714
1310460  0001004e 00000000 0007f21c 03003ecf 00002c07 0000000c 000cc850 000cc850 0001004e 00000000 2cac0000 0002438a
1310540  2ca00000 00000000 00000001 000c6bec 000c6cb0 0002438a 000ca36c ffffffff 03003ed7 00002c07 0000000c 000df638
1310620  000df638 00010056 00000000 2cac0000 0002438a 2ca00000 00000000 00000001 000c6d6c 000c72ac 0002438a 000cc738
1310700  000c9af0 ffffffff 03003edf 00002c07 0000000c 000dff20 000dff20 00010056 00000000 ffffffff 03003ee7 00002c07
1310760  0000000c 000cefdc 000cefdc 0001004f 00000000 0007f23c 03003eef 00002c07 0000000c 000dabac 000dabac 00010054
1311040  00000000 ffffffff 03003ef7 00002c07 0000000c 000dac34 000dac34 00010054 00000000 000e636f 6d706f6e 656e745f
1311120  6465636c 00000000 ffffffff 03003eff 00002c07 0000000c 000e4838 000e4838 00010058 00000000 ffffffff 03003f07
1311200  00002c07 0000000c 000e68e0 000e68e0 00010059 00000000 ffffffff 03003f0f 00002c07 0000000c 000e693c 000e693c
1311260  00010059 00000000 0007f25c 03003f17 00002c07 0000000c 000dacdc 000dacdc 00010054 00000000 2cac0000 0002438a
1311340  2ca00000 00000000 00000001 000c73b0 000c7474 0002438a 000cc874 000c97b8 00157061 636b6167 65626f64 795f6465
1311420  636c5f70 61727400 ffffffff 03003f1f 00002c07 0000000c 000cc8f0 000cc8f0 0001004e 00000000 0008011c 0400371f
1311500  00002c07 00000010 000a9269 000a92ec 00010054 00000000 ffffffff 03003f27 00002c07 0000000c 000cc990 000cc990
1311560  0001004e 00000000 2cac0000 0002438a 2ca00000 00000000 00000001 000c75dc 000c75dc 0002438a 000cc914 000c75e8
1311640  00157061 636b6167 65626f64 795f6465 636c5f69 74656d00 001b6d6f 72655f70 61636b61 6765626f 64795f64 65636c5f
1311720  6974656d 73000000 ffffffff 03003f3f 00002c07 0000000c 000cc9d8 000cc9d8 0001004e 00000000 ffffffff 03003f47
1312000  00002c07 0000000c 000cca00 000cca00 0001004e 00000000 2cac0000 0002438a 2ca00000 00000000 00000001 000c7808
1312060  000c78cc 0002438a 000cc9b4 000c93cc 0007f27c 03003f4f 00002c07 0000000c 000cf278 000cf278 0001004f 00000000
1312140  2cac0000 0002438a 2ca00000 00000000 00000001 000c79ac 000c7d38 0002438a 000cc9fc 000c91fc 2cac0000 0002438a
1312220  2ca00000 00000000 00000001 000c7e3c 000c7f00 0002438a 000cca24 000c910c 2cac0000 0002438a 2ca00000 00000000
1312300  00000001 000c8038 000c8134 0002438a 000cca4c 000c8fb4 000e6172 63685f73 746d745f 70617274 00000000 b464feac
1312360  000cad04 000bfea8 000f626c 6f636b5f 6465636c 5f697465 6400ca50 000c9d94 000ca890 2b24ca68 0002438a 000cac7c
1312440  b464ca90 000cac00 000cca64 b464ca9c 000cab60 000cca98 b464caa8 000ca674 000ccaa4 0007456e 74697479 2000cac8
1312520  00096172 63685f62 6f647900 000ccbd4 0000002c b288b66c 0000034e 7fffffff 000c6318 02000ce5 0100147d 01002d65
1312600  0000000b 00002aff 002d2f69 6f6d652f 6f736173 312f612f 73726565 2f73656d 616e7469 635f6368 65636b31 2f646573
1312660  69676e66 696c6500 00302f69 6f6d652f 6f736173 312f612f 73726565 2f73656d 616e7469 635f6368 65636b31 2f646573
1312740  69676e66 696c652e 706c0020 0000002c 000d0884 b27cb66c 00000350 7fffffff 000ca5d8 02000ce5 0200293d 0000419f
1313020  00000283 00002aff 0000002c 000d08b0 b27cb66c 0000036d 7fffffff 000ca604 02000ce5 02001f6d 0000419f 00002c07
1313100  00002aff 000f656e 74697479 5f646563 6c706172 74000000 000ccd00 0000002c b27cb66c 00000352 0000036c 0009cbc1
1313160  02000ce5 02002385 0000419f 00002c07 00002aff 00000100 000c1a94 b27cb66c 00000353 7fffffff 000ccebc 02000ce5
1313240  020031ed 020031e5 000041a7 02000a3d 01002d65 02000a3d 01002825 01003a4d 0000000c 01002825 01003a45 00000010
1313320  02000a3d 01002d65 02000a3d 01002825 01004165 00000014 01002825 0100416d 00000018 02000a3d 01002d65 01003a3d
1313400  0000001c 02000a3d 02000885 00003b77 00000020 02000a3d 02000885 000041af 00000024 02000a3d 0000083f 01002d65
1313460  02000a3d 000041b7 000041bf 020031f5 00003ebf 02000a3d 01002815 01003a3d 00000028 02000a3d 01001b75 01003a3d
1313540  0000001e 02000a3d 02000885 00000022 00003ebf 02000885 00000026 00003ebf 00002aff 000ccfb0 00000064 b27cb66c
1313620  00000354 0000036e 000ccfb4 02000ce5 05001b0d 000041a7 0000001b 00002c07 00694003 00000283 00002aff 000ccfb0
1313700  0000002c b4f0b4e4 00000353 7fffffff 0007eaad 00000000 00000000 000cd9ac 0002438a 000d2af8 2c780154 0002438a
1313760  54100000 03003287 4b8c0000 000041a7 64205818 686855f0 69b05370 56f8671c 53705aec 020031f7 4b8c0000 00003ebf
1314040  5a180000 02000a3f 64205c30 01002817 5a180000 01003a3f 5fa05aec 02000a3f 64205c30 01001b77 5a180000 01003a3f
1314120  6af00020 5d100000 02000a3f 64205c30 02000887 6e084af8 00003ebf 5d100000 02000887 6d3c4af8 00003ebf 4728001c
```

1314200 476843e4 01003a4f 5fa043c0 02000c4f 4b8c0000 00002c07 6bb4247c 0008042c 002443e4 01003a47 5fa043c0 02000c4f
1314260 4b8c0000 00002c07 6bb4247c 0008042c 002443e4 01004167 5fa043c0 02000cdf 4b8c0000 00002c07 6bb4247c 0008042c
1314340 002443e4 0100416f 5fa043c0 02000cdf 4b8c0000 00002c07 6bb4247c 0008042c 00243c9c 00000020 000c652c 002033bc
1314420 342c001c 3c480000 000d2820 0018386c 313039a4 000d2840 000c2ecc 24d00000 000d2860 000c234c 000d2880 000000f8
1314500 000ccc04 b27cb66c 00000355 7fffffff 000c4140 02000ce5 020031ed 020031e5 00003b77 02000a3d 02000885 000041c7
1314560 0000000c 02000a3d 02000885 000041cf 00000010 01002d65 02000a3d 01003a3d 00000014 02000a3d 0200226d 00000018
1314640 02000a35 00000016 0000000b 02000a3d 01001b75 01003a3d 0000001a 01002815 01003a3d 00000016 020031f5 00003ebf
1314720 02000a3d 02000885 0000000e 00003ebf 02000a3d 02000885 00000012 00003ebf 02000a3d 01003a3d 0000001c 02000a3d
1315000 0200226d 00000020 02000a35 0000001e 0000000b 02000a3d 01001b75 01003a3d 00000022 01002815 01003a3d 0000001e
1315060 00002aff 000cd1a8 00000038 b27cb66c 00000356 0000036f 000cd1ac 02000ce5 05001b0d 00003b77 0000001b 00002c07
1315140 00694103 00000283 00002aff 2c780154 0002438a 5d100000 03003287 4b8c0000 00003b77 60cc56f8 671c55f0 68405370
1315220 581867b8 53705c30 020031f7 4b8c0000 00003ebf 5a180000 02000a3f 66700018 5c9c0018 02000887 6b744af8 00003ebf
1315300 5e540000 02000a3f 66700018 5c9c0018 02000887 6d804af8 00003ebf 5e540000 02000a3f 65300018 5e540000 01003a3f
1315360 67b85ec0 00000018 02000a3f 66c0001c 00185ec0 0000001c 0200226f 67ec001c 5a180000 02000a37 6c344af8 0000000b
1315440 5c9c0018 02000a3f 66c00020 00185ec0 00000020 01001b77 5a180000 01003a3f 6c84001c 5c9c0018 01002817 5a180000
1315520 01003a3f 6c34477c 33d8247c 000d28c4 001c3880 3d3c39f8 000d28e4 00103280 24d00000 000c652c 0010aa18 aaf00001
1315600 ac0843e4 01003a3f 6b7443c0 02000cdf 4b8c0000 00002c07 6bb4247c 0007eb8c 001043e4 01003a3f 6d0c43c0 02000cdf
1315660 4b8c0000 00002c07 6bb4234c 000803ec 0000006c 000ccebc b27cb66c 00000357 7fffffff 000cd260 02000ce5 020031ed
1315740 020031e5 000041af 02000a3d 02000885 00003b77 0000000c 02000885 000041af 00000010 020031f5 00003ebf 02000a3d
1316020 02000885 0000000e 00003ebf 02000885 00000012 00003ebf 00002aff 000cd328 00000038 b27cb66c 00000358 00000370
1316100 000cd32c 02000ce5 05001b0d 000041af 0000001b 00002c07 00694203 00000283 00002aff 27f0007c 000cd28c 5d100000
1316160 03003287 4b8c0000 000041af 60cc56f8 671c55f0 682c5370 581867b8 53705c30 020031f7 4b8c0000 00003ebf 5a180000
1316240 02000a3f 66700018 5c9c0018 02000887 6b744af8 00003ebf 5e540000 02000887 6d3c4af8 00003ebf 476833bc 24d00000
1316320 000d2820 0018386c 3d302340 000d2840 00000034 000cd140 b27cb66c 00000359 7fffffff 000cd2c0 02000ce5 020031ed
1316400 020031e5 000041af 00000007 00003ebf 00002aff 2954002a 0002438a 5d100000 03003287 4b8c0000 000041af 537055f0
1316460 4b8c0000 00003ebf 53704960 228c6923 0000006c 000cd260 b27cb66c 0000035a 7fffffff 000cd3e0 02000ce5 020031ed
1316540 020031e5 000041c7 02000a3d 02000885 000041d7 0000000c 02000885 000041df 00000010 020031f5 00003ebf 02000a3d
1316620 02000885 0000000e 00003ebf 02000885 00000012 00003ebf 00002aff 000cd488 00000038 b27cb66c 0000035b 00000371
1316700 000cd48c 02000ce5 05001b0d 000041c7 0000001b 00002c07 00694623 00000283 00002aff 27f0007c 000cd40c 5d100000
1316760 03003287 4b8c0000 000041c7 60cc56f8 671c55f0 682c5370 581867b8 53705c30 020031f7 4b8c0000 00003ebf 5a180000
1317040 02000a3f 66700018 5c9c0018 02000887 6b744af8 00003ebf 5e540000 02000887 6d3c4af8 00003ebf 476833bc 24d00000
1317120 000d2950 0018386c 3d302340 000d2970 00000034 000c42c0 b27cb66c 0000035c 7fffffff 000cd440 02000ce5 020031ed
1317200 020031e5 000041c7 00000007 00003ebf 00002aff 2954002a 0002438a 5d100000 03003287 4b8c0000 000041c7 537055f0
1317260 4b8c0000 00003ebf 53704960 228c616e 0000004c 000cd3e0 b27cb66c 0000035d 7fffffff 000cd510 02000ce5 020031ed
1317340 020031e5 000041d7 02000885 00003f17 0000000c 020031f5 00003ebf 02000885 0000000e 00003ebf 00002aff 000cd578
1317420 00000038 b27cb66c 0000035e 00000372 000cd57c 02000ce5 05001b0d 000041d7 0000001b 00002c07 00694a83 00000283
1317500 00002aff 2c78004c 0002438a 5d100000 03003287 4b8c0000 000041d7 60cc56f8 671c5370 581867b8 53705c30 020031f7
1317560 4b8c0000 00003ebf 5a180000 02000887 6b744af8 00003ebf 239c0000 000cc840 0000006c 000cd440 b27cb66c 0000035f
1317640 7fffffff 000cd630 02000ce5 020031ed 020031e5 000041df 02000a3d 02000885 000041d7 0000000c 02000885 000041df
1317720 00000010 020031f5 00003ebf 02000a3d 02000885 0000000e 00003ebf 02000885 00000012 00003ebf 00002aff 000cd6d8
1320000 00000038 b27cb66c 00000360 00000373 000cd6dc 02000ce5 05001b0d 000041df 0000001b 00002c07 00694b83 00000283
1320060 00002aff 27f0007c 000cd65c 5d100000 03003287 4b8c0000 000041df 60cc56f8 671c55f0 682c5370 581867b8 53705c30
1320140 020031f7 4b8c0000 00003ebf 5a180000 02000a3f 66700018 5c9c0018 02000887 6b744af8 00003ebf 5e540000 02000887
1320220 6d3c4af8 00003ebf 476833bc 24d00000 000d2950 0018386c 3d302340 000d2970 00000034 000cd510 b27cb66c 00000361
1320300 7fffffff 000cd690 02000ce5 020031ed 020031e5 000041df 00000007 00003ebf 00002aff 2954002a 0002438a 5d100000
1320360 03003287 4b8c0000 000041df 537055f0 4b8c0000 00003ebf 53704960 228c7365 0000004c 000cd630 b27cb66c 00000362
1320440 7fffffff 000cd760 02000ce5 020031ed 020031e5 000041cf 02000885 000041e7 0000000c 020031f5 00003ebf 02000885
1320520 0000000e 00003ebf 00002aff 000cd840 00000038 b27cb66c 00000363 00000374 000cd844 02000ce5 05001b0d 000041cf
1320600 0000001b 00002c07 00694723 00000283 00002aff 27f0004c 000cd7a4 5d100000 03003287 4b8c0000 000041cf 60cc56f8
1320660 671c5370 581867b8 53705c30 020031f7 4b8c0000 00003ebf 5a180000 02000887 6b744af8 00003ebf 239c0000 000d2a28
1320740 0000004c 000cd690 b27cb66c 00000364 7fffffff 000cd7f8 02000ce5 020031ed 020031e5 000041cf 02000885 000041ef
1321020 0000000c 020031f5 00003ebf 02000885 0000000e 00003ebf 00002aff 2954004c 0002438a 5d100000 03003287 4b8c0000
1321100 000041cf 60cc56f8 671c5370 581867b8 53705c30 020031f7 4b8c0000 00003ebf 5a180000 02000887 6b744af8 00003ebf
1321160 239c0000 000d2a70 0000004c 000cd760 b27cb66c 00000365 7fffffff 000cd8c8 02000ce5 020031ed 020031e5 000041e7
1321240 02000885 000041f7 0000000c 020031f5 00003ebf 02000885 0000000e 00003ebf 00002aff 000cd9a8 00000038 b27cb66c

| | | | | | | | | | | | | |
|---|---|---|---|---|---|---|---|---|---|---|---|---|
| 1321320 | 00000366 | 00000375 | 000cd9ac | 02000ce5 | 05001b0d | 000041e7 | 0000001b | 00002c07 | 00695143 | 00000283 | 00002aff | 27f0004c |
| 1321400 | 000cd90c | 5d100000 | 03003287 | 4b8c0000 | 000041e7 | 60cc56f8 | 671c5370 | 581867b8 | 53705c30 | 020031f7 | 4b8c0000 | 00003ebf |
| 1321460 | 5a180000 | 02000887 | 6b744af8 | 00003ebf | 239c0000 | 00042a90 | 0000004c | 000cd7f8 | b27cb66c | 00000367 | 7fffffff | 000cd960 |
| 1321540 | 02000ce5 | 020031ed | 020031e5 | 000041e7 | 02000885 | 00003e97 | 0000000c | 020031f5 | 00003ebf | 02000885 | 0000000e | 00003ebf |
| 1321620 | 00002aff | 2954004c | 0002438a | 5d100000 | 03003287 | 4b8c0000 | 000041e7 | 60cc56f8 | 671c5370 | 581867b8 | 53705c30 | 020031f7 |
| 1321700 | 4b8c0000 | 00003ebf | 5a180000 | 02000887 | 6b744af8 | 00003ebf | 239c0000 | 000cc5ac | 0000004c | 000cd8c8 | b27cb66c | 00000368 |
| 1321760 | 7fffffff | 000cda70 | 02000ce5 | 020031ed | 020031e5 | 000041ef | 02000885 | 00003f77 | 0000000c | 020031f5 | 00003ebf | 02000885 |
| 1322040 | 0000000e | 00003ebf | 00002aff | 000cdc50 | 00000078 | b130b66c | 00000369 | 00000376 | 000ccd3d | 02000ce5 | 05001b0d | 000041ef |
| 1322120 | 0000001b | 00002c07 | 00695383 | 00000283 | 00002aff | 000cdc50 | 00000040 | 00000000 | 00000000 | 00000000 | 000cffd0 | 00000000 |
| 1322200 | 00000000 | 000cfcb0 | 000cf960 | 000cfb14 | 000cfe88 | 000cf774 | 000cf61c | 000d0060 | 00000000 | 27f0004c | 000cdab4 | 5d100000 |
| 1322260 | 03003287 | 4b8c0000 | 000041ef | 60cc56f8 | 671c5370 | 581867b8 | 53705c30 | 020031f7 | 4b8c0000 | 00003ebf | 5a180000 | 02000887 |
| 1322340 | 6b744af8 | 00003ebf | 239c0000 | 000ceaec | 0000004c | 000cd960 | b27cb66c | 0000036a | 7fffffff | 000d091c | 02000ce5 | 020031ed |
| 1322420 | 020031e5 | 000041ef | 02000885 | 00003f1f | 0000000c | 020031f5 | 00003ebf | 02000885 | 0000000e | 00003ebf | 00002aff | 2954004c |
| 1322500 | 0002438a | 5d100000 | 03003287 | 4b8c0000 | 000041ef | 60cc56f8 | 671c5370 | 581867b8 | 53705c30 | 020031f7 | 4b8c0000 | 00003ebf |
| 1322560 | 5a180000 | 02000887 | 6b744af8 | 00003ebf | 239c0000 | 000cc8a0 | 2c7800d4 | 0002438a | 5d100000 | 03003287 | 4b8c0000 | 0000422f |
| 1322640 | 60cc56f8 | 671c55f0 | 687c002c | 55f06af0 | 022455f0 | 6af0001c | 55f06a00 | 53705818 | 67b85370 | 5e540000 | 020031f7 | 65300018 |
| 1322720 | 5e540000 | 01003ebf | 67b85ec0 | 00000018 | 02000887 | 6e580024 | 5a180000 | 01003ebf | 6c3436a4 | 477c3540 | 00180030 | 362c320c |
| 1323000 | 43000000 | 000020af | 000cc5cc | 00342ecc | 34a00028 | 3eec0030 | 382c002c | 31f0247c | 000cf098 | 002c3410 | 00203e70 | 00283c9c |
| 1323060 | 00000024 | 000d504c | 00243468 | 3eec0020 | 382c001c | 3280247c | 000cf048 | 001c38e8 | 346c37f0 | 3cf4234c | 000cc8c0 | 00000078 |
| 1323140 | 000d26fc | b27cb66c | 000003a9 | 7fffffff | 000cdd18 | 02000ce5 | 020031ed | 020031e5 | 0000426f | 02000a3d | 02000885 | 000020af |
| 1323220 | 0000000c | 02000885 | 00004277 | 00000010 | 020031f5 | 01003ebd | 00000014 | 02000a3d | 02000885 | 0000000e | 01003ebd | 00000016 |
| 1323300 | 02000885 | 00000012 | 01003eb4 | 00000016 | 00002aff | 000cde34 | 00000038 | b27cb66c | 000003aa | 000003c1 | 000cde38 | 02000ce5 |
| 1323360 | 05001b0d | 0000426f | 0000001b | 00002c07 | 006a8263 | 0000028b | 00002aff | 2c78008c | 0002439a | 5d100000 | 03003287 | 4b8c0000 |
| 1323440 | 0000426f | 60cc56f8 | 671c55f0 | 682c5370 | 591867b8 | 53705c30 | 020031f7 | 65300018 | 5e540000 | 01003ebf | 67b85ec0 | 00000018 |
| 1323520 | 02000a3f | 66c0001c | 00185ec0 | 0000001c | 02000887 | 6b7458e0 | 01003ebf | 6c345ec0 | 00000018 | 02000887 | 6d3c58e0 | 01003ebf |
| 1323600 | 6c344768 | 33bc247c | 000d50bc | 0018386c | 31302340 | 000d50dc | 00000120 | 000cdbdc | b27cb66c | 000003ab | 7fffffff | 000ce018 |
| 1323660 | 02000ce5 | 020031ed | 020031e5 | 000020af | 02000a3d | 02003645 | 00001d77 | 0000000c | 02000a3d | 02000885 | 000040d7 | 00000010 |
| 1323740 | 02000a3d | 010040dd | 00000014 | 02000a3d | 02000885 | 000040f7 | 00000018 | 02000a3d | 02000885 | 00003c57 | 0000001c | 02000885 |
| 1324020 | 000040ef | 00000020 | 020031f5 | 01003ebd | 00000024 | 02000a3d | 02000885 | 00000012 | 02003ebd | 00000026 | 00000028 | 02000a3d |
| 1324100 | 02000885 | 0000001a | 01003ff5 | 0000002c | 02000a3d | 02000885 | 0000001e | 02004005 | 00000026 | 00000030 | 02000a3d | 02000885 |
| 1324160 | 00000022 | 02003ff5 | 00000026 | 00000034 | 02000a3d | 0000083f | 03003af5 | 00000026 | 00000016 | 03001d6d | 0000002a | 00000001 |
| 1324240 | 0000002e | 00000001 | 00000032 | 00000007 | 00000036 | 00002aff | 000ce324 | 00000038 | b27cb66c | 000003ac | 000003c2 | 000ce328 |
| 1324320 | 02000ce5 | 05001b0d | 000020af | 0000001b | 00002c07 | 006a85e3 | 0000028b | 00002aff | 27f001a8 | 000ce120 | 5d100000 | 03003287 |
| 1324400 | 4b8c0000 | 000020af | 60cc56f8 | 671c55f0 | 687c0034 | 55f06af0 | 002c55f0 | 6af00020 | 55f06aa0 | 55f069b0 | 53705818 | 67b85370 |
| 1324460 | 5e540000 | 020031f7 | 66700018 | 5c9c0018 | 01003ebf | 67ec0024 | 5e540000 | 02000a3f | 66700018 | 5c9c0018 | 02000887 | 6e580034 |
| 1324540 | 5a180000 | 02003ebf | 6c840024 | 67ec001c | 5e540000 | 02000a3f | 56700018 | 5c9c0018 | 02000887 | 6e580020 | 5a180000 | 01003ff7 |
| 1324620 | 67ec0018 | 5e540000 | 02000a3f | 65300020 | 5e540000 | 02000887 | 6e0858e0 | 02004007 | 6c840024 | 67b85ec0 | 00000020 | 02000a3f |
| 1324700 | 66c00020 | 00285ec0 | 00000020 | 02000887 | 6d3c58e0 | 02003ff7 | 6c840024 | 67ec0020 | 5c9c0028 | 02000a3f | 4b8c0000 | 0000083f |
| 1324760 | 5a180000 | 03003af7 | 6c840024 | 6af00028 | 5a180000 | 03001d6f | 6c84001c | 67ec001c | 6c840020 | 5878001c | 6c840018 | 55f06c34 |
| 1325040 | 537036a4 | 47683540 | 00180039 | 362c320c | 41000000 | 00001d77 | 000cc5cc | 003c3410 | 00303e70 | 00383c9c | 00000034 | 000cfb54 |
| 1325120 | 00343aa0 | 00243eec | 0030382c | 002c3c9c | 00000028 | 000cfb74 | 00283410 | 001c3e70 | 00243c9c | 00000020 | 000cfc44 | 002033bc |
| 1325200 | 3e70001c | 3c480000 | 000cfbb4 | 0018386c | 31302340 | 000cfbd4 | 00000110 | 000cdd18 | b27cb66c | 000003ad | 7fffffff | 000ce2a4 |
| 1325260 | 02000ce5 | 020031ed | 020031e5 | 000020af | 02000a3d | 02000885 | 000040d7 | 0000000c | 02000a3d | 010040dd | 00000010 | 02000a3d |
| 1325340 | 02000885 | 000040f7 | 00000014 | 02000a3d | 02000885 | 00003c57 | 00000018 | 02000885 | 000040ef | 0000001c | 020031f5 | 01003ebd |
| 1325420 | 00000020 | 02000a3d | 02000885 | 0000000e | 02003ebd | 00000022 | 00000024 | 02000a3d | 02000885 | 00000016 | 01003ff5 | 00000028 |
| 1325500 | 02000a3d | 02000885 | 0000001a | 02004005 | 00000022 | 0000002c | 02000a3d | 02000885 | 0000001e | 02003ff5 | 00000022 | 00000030 |
| 1325560 | 02000a3d | 0000083f | 03003af5 | 00000022 | 00000012 | 03001d6d | 00000026 | 00000001 | 0000002a | 00000001 | 0000002e | 00000007 |
| 1325640 | 00000032 | 00002aff | 2954017c | 0002438a | 51100000 | 03003287 | 4b8c0000 | 000020af | 60cc56f8 | 671c55f0 | 687c002c | 55f06af0 |
| 1325720 | 002055f0 | 6aa055f0 | 69b05370 | 581867b8 | 53705c30 | 020031f7 | 66700018 | 5c9c0018 | 01003ebf | 67ec0024 | 5e540000 | 02000a3f |
| 1326000 | 66700018 | 5c9c0018 | 02000887 | 6b7458e0 | 02003ebf | 6c840024 | 67ec001c | 5e540000 | 02000a3f | 66700018 | 5c9c0018 | 02000887 |
| 1326060 | 6e580020 | 5a180000 | 01003ff7 | 67ec0018 | 5e540000 | 02000a3f | 65300020 | 5e540000 | 02000887 | 6e0858e0 | 02004007 | 6c840024 |
| 1326140 | 67b85ec0 | 00000020 | 02000a3f | 66c00020 | 00285ec0 | 00000020 | 02000887 | 6d3c58e0 | 02003ff7 | 6c840024 | 67ec0020 | 5c9c0028 |
| 1326220 | 02000a3f | 4b8c0000 | 0000083f | 5a180000 | 03003af7 | 6c840024 | 6af00028 | 5a180000 | 03001d6f | 6c84001c | 67ec001c | 6c840020 |
| 1326300 | 5978001c | 6c840018 | 55f06c34 | 53704768 | 34100030 | 24d00000 | 000cfb54 | 00343aa0 | 00243eec | 0030382c | 002c3c9c | 00000028 |
| 1326360 | 000cfb74 | 00283410 | 001c3e70 | 00243c9c | 00000020 | 000cfc44 | 002033bc | 3e70001c | 3c480000 | 000cfbb4 | 0018386c | 3d302340 |

| | | | | | | | | | | | | |
|---|---|---|---|---|---|---|---|---|---|---|---|---|
| 1326440 | 000cfbd4 | 00000094 | 000ce018 | b27cb66c | 000003ae | 7fffffff | 000ce408 | 02000ce5 | 020031ed | 020031e5 | 00004277 | 02000a3d |
| 1326520 | 010040b5 | 0000000c | 02000a3d | 02000885 | 000020af | 00000010 | 02000885 | 00004277 | 00000014 | 020031f5 | 01003ebd | 00000018 |
| 1326600 | 02000a3d | 02000885 | 00000012 | 01003ebd | 0000001a | 02000885 | 00000016 | 01003ebd | 0000001a | 00002aff | 000ce46c | 00000038 |
| 1326660 | b130b66c | 000003af | 000003c3 | 000d0a61 | 02000ce5 | 05001b0d | 00004277 | 0000001b | 00002c07 | 006a86e3 | 0000028b | 00002aff |
| 1326740 | 27f000a8 | 000ce438 | 54100000 | 03003287 | 4a8c0000 | 00004277 | 60cc56f8 | 671c55f0 | 686855f0 | 69b05370 | 581867b8 | 53705c30 |
| 1327020 | 020031f7 | 65300018 | 5e540000 | 01003ebf | 67b85ec0 | 00000018 | 02000a3f | 66c0001c | 00185ec0 | 0000001c | 02000887 | 6e0858e0 |
| 1327100 | 01003ebf | 6c345ec0 | 00000018 | 02000887 | 633c58e0 | 01003ebf | 6c344769 | 34a0001c | 364035c8 | 31f0247c | 000cf990 | 002033bc |
| 1327160 | 3e70001c | 3c480000 | 000450bc | 0018386c | 31302340 | 000d50dc | 00000038 | 000ce2a4 | b27cb66c | 000003b0 | 7fffffff | 000d2c90 |
| 1327240 | 02000ce5 | 020031ed | 020031e5 | 00004277 | 00000007 | 01003ebd | 0000000c | 00002aff | 2754002e | 0002438a | 5d100000 | 03003287 |
| 1327320 | 4b8c0000 | 00004277 | 537055f0 | 671c5370 | 54100000 | 01003ebf | 5fa04960 | 228c636b | 000d07ec | 00000574 | 6373284d | 6f64756c |
| 1327400 | 65292e20 | 0a70726f | 63657373 | 5f646563 | 6c5f6974 | 656d203c | 2d2d2061 | 7474725f | 6465636c | 2353203c | 2d206368 | 65636b5f |
| 1327460 | 73656d61 | 6e746963 | 73284d6f | 64756c65 | 29202d3d | 20532361 | 6865636b | 5f73656d | 616e7469 | 6373284d | 6f64756c | 65292e20 |
| 1327540 | 200a7072 | 6f636571 | 735f6465 | 636c5f69 | 74656d20 | 3c2d2d20 | 61747472 | 5f737065 | 63235320 | 3c2d2063 | 6865636b | 5f73656d |
| 1327620 | 616e7469 | 6373284d | 6f64756c | 6529202d | 34205323 | 63686563 | 6b5f7365 | 6d616e74 | 69637328 | 4d6f6475 | 6c65292e | 20200a70 |
| 1327700 | 726f6365 | 73735f64 | 65636c5f | 6974656d | 203c2d2d | 20757365 | 5f636c23 | 53203c2d | 20636865 | 636b5f73 | 656d616e | 74696373 |
| 1327760 | 284d6f64 | 756c6529 | 202d3d20 | 53236368 | 65636b5f | 73656d61 | 6e746963 | 73284d6f | 64756c65 | 292e200a | 0a70726f | 63657373 |
| 1330040 | 5f73746d | 745f7061 | 7274203c | 2d2d2073 | 65715f6f | 665f7374 | 6d747323 | 53203c2d | 20636865 | 636b5f73 | 656d616e | 74696373 |
| 1330120 | 284d6f64 | 756c6529 | 202d3d20 | 53236368 | 65636b5f | 73656d61 | 6e746963 | 73284d6f | 64756c65 | 2c5f292e | 0a0a6d6f | 72655f70 |
| 1330200 | 726f6365 | 73735f64 | 65636c5f | 6974656d | 73203c2d | 2d207072 | 6f636571 | 735f6465 | 636c5f69 | 74656d21 | 502c206d | 6f72655f |
| 1330260 | 70726f63 | 6573735f | 6465636c | 5f697465 | 6d73234d | 0a090909 | 3c2d2063 | 6865636b | 5f73656d | 616e7469 | 6373284d | 6f64756c |
| 1330340 | 6529202d | 34205023 | 63686563 | 6b5f7365 | 6d616e74 | 69637328 | 4d6f6475 | 6c65292c | 204d2363 | 6865636b | 5f73656d | 616e7469 |
| 1330420 | 6373284d | 6f64756c | 65292e0a | 6d6f7265 | 5f70726f | 63657373 | 5f646563 | 6c5f6974 | 656d7320 | 3c2d2d20 | 5b5d203c | 2d206368 |
| 1330500 | 65636b5f | 73656d61 | 6e746963 | 73285f29 | 2e0a0a65 | 6e645f70 | 726f635f | 73746d74 | 203c2d2d | 20696428 | 656e642c | 5f292c20 |
| 1330560 | 69642870 | 726f6365 | 73732c5f | 292c2069 | 64284932 | 2c4c3229 | 2c207365 | 6d69636f | 6c6f6e31 | 285f290a | 09093c2d | 20636865 |
| 1330640 | 636b5f73 | 656d616e | 74696373 | 2849312c | 4c312920 | 2d3d206d | 61746368 | 2849312c | 49322c4c | 312c4c32 | 292e0a65 | 6e645f70 |
| 1330720 | 726f635f | 73746d74 | 203c2d2d | 20696428 | 656e642c | 5f292c20 | 69642870 | 726f6365 | 73732c5f | 292c2069 | 64284932 | 2c4c7329 |
| 1331000 | 2c20212c | 207b6973 | 615f7265 | 73657276 | 65645f77 | 6f726428 | 4932297d | 2c207365 | 6d69636f | 6c6f6e28 | 4c73290a | 09093c2d |
| 1331060 | 20636865 | 636b5f73 | 656d616e | 74696373 | 2849312c | 4c312920 | 2d3d206d | 61746368 | 2849312c | 49322c4c | 312c4c71 | 292e0a65 |
| 1331140 | 6e645f70 | 726f635f | 73746d74 | 203c2d2d | 20696428 | 656e642c | 5f292c20 | 69642870 | 726f6365 | 73732c4c | 73292c20 | 73656d69 |
| 1331220 | 636f6c6f | 6e284c73 | 290a0909 | 3c2d2063 | 6865636b | 5f73656d | 616e7469 | 6373285f | 2c5f292e | 0a656e64 | 5f70726f | 635f7374 |
| 1331300 | 6d74203c | 2d2d2069 | 6428656e | 642c4c73 | 292c2073 | 656d6963 | 6f6c6f6e | 284c7329 | 0a09093c | 2d206368 | 65636b5f | 73656d61 |
| 1331360 | 6e746963 | 73285f2c | 4c732920 | 2d3d2077 | 72697465 | 28274d69 | 7373696e | 6720776f | 72642022 | 70726f63 | 65737322 | 20616674 |
| 1331440 | 65722022 | 656e6422 | 206f6e20 | 6c696e65 | 2027292c | 0a090909 | 09090977 | 72697465 | 284c7329 | 2c206e6c | 2e0a0a6c | 6162656c |
| 1331520 | 203c2d2d | 20696428 | 492c4c29 | 2c20636f | 6c6f6e31 | 285f2920 | 3c2d2076 | 616c7565 | 28492c4c | 29202d3d | 20657272 | 5f696428 |
| 1331600 | 492c4c29 | 3b207472 | 75652e0a | 6c616265 | 6c203c2d | 2d205b5d | 203c2d20 | 76616c75 | 65285b5d | 2c6e6561 | 725f7072 | 6f636573 |
| 1331660 | 73292e0a | 0a636f6c | 6f6e284c | 29203c2d | 2d20636f | 6c6f6e31 | 285f292c | 20212c20 | 7b617373 | 6572746f | 6e6c7928 | 666f756e |
| 1331740 | 645f636f | 6c6f6e28 | 4c29297d | 2e0a636f | 6c6f6e28 | 4c29203c | 2d2d205b | 5d2c207b | 61737365 | 72746f6e | 6c792866 | 6f756e64 |
| 1332020 | 5f6e6f5f | 636f6c6f | 6e284c29 | 297d2e0a | 0a636f6e | 63757272 | 656e745f | 70726f63 | 65647572 | 655f6361 | 6c6c203c | 2d2d2069 |
| 1332100 | 6428492c | 4c292c20 | 6c706172 | 656e7468 | 285f292c | 20617373 | 6f635f6c | 69737428 | 412c2072 | 70617265 | 6e746828 | 5f292c0a |
| 1332160 | 09090909 | 73656d69 | 636f6c6f | 6e31285f | 290a2020 | 20202020 | 20202020 | 20202020 | 2020093c | 2d206368 | 65636b5f | 73656d61 |
| 1332240 | 6e746963 | 73284d6f | 64756c65 | 29202d3d | 200a2020 | 20202020 | 20202020 | 20202020 | 20202020 | 20202020 | 20202020 | 20202020 |
| 1332320 | 20207072 | 6f636564 | 7572655f | 65786973 | 7473284d | 6f64756c | 652c4929 | 202d3e20 | 74727565 | 2c200a20 | 20202020 | 20202020 |
| 1332400 | 20202020 | 20202020 | 20202020 | 20202020 | 20202020 | 20202041 | 2376616c | 7565284d | 6f64756c | 652c4176 | 616c292c | 0a202020 |
| 1332460 | 20202020 | 20202020 | 20202020 | 20202020 | 20202020 | 20202020 | 20202020 | 204d6f64 | 756c653a | 61737365 | 72747a28 | 7673284c |
| 1332540 | 2c70726f | 0007f2dc | 03003f77 | 00002c07 | 0000000c | 000ceb3c | 000ceb3c | 0001004f | 00000000 | 0007f31c | 03003f7f | 00002c07 |
| 1332620 | 0000000c | 000ceb60 | 000ceb60 | 0001004f | 00000000 | ffffffff | 03003f97 | 00002c07 | 0000000c | 000cebdc | 000cebdc | 0001004f |
| 1332700 | 00000000 | 2cac0000 | 0002438a | 2ca00000 | 00000000 | 00000001 | 000ca884 | 000ca884 | 0002438a | 000cca88 | 2cac0000 | 0002438a |
| 1332760 | 2ca00000 | 00000000 | 00000001 | 000cabc4 | 000cac6c | 0002438a | 000cca84 | 00156d6f | 72655f62 | 6c6f636b | 5f646563 | 6c5f6974 |
| 1333040 | 656d7300 | 0007f39c | 03003f9f | 00002c07 | 0000000c | 000cee50 | 000cee50 | 0001004f | 00000000 | 0007f3bc | 03003fa7 | 00002c07 |
| 1333120 | 0000000c | 000cef5c | 000cef5c | 0001004f | 00000000 | 2cac0000 | 0002438a | 2ca00000 | 00000000 | 00000001 | 000cad68 | 000cae10 |
| 1333200 | 0002438a | 000cec00 | 000c8f74 | 000f636f | 6e637572 | 72656e74 | 5f737464 | 74000000 | 00156d6f | 72655f63 | 6f6e6375 | 7272656e |
| 1333260 | 745f7374 | 64747300 | ffffffff | 03003faf | 00002c07 | 0000000c | 000ceca8 | 000ceca8 | 0001004f | 00000000 | 0007f3dc | 03003fb7 |
| 1333340 | 00002c07 | 0000000c | 000cee04 | 000cee04 | 0001004f | 00000000 | 2b240000 | 0002438a | 000cae20 | b4640000 | 000caea8 | 000cecf4 |
| 1333420 | 000b854c | 03003fbf | 00002c07 | 0000000c | 000cff48 | 000cff48 | 0001004f | 00000000 | 2cac0000 | 0002438a | 2ca00000 | 00000000 |
| 1333500 | 00000001 | 000caf24 | 000cb118 | 0002438a | 000ceccc | 000c8e0c | 0021636f | 6e637572 | 72656e74 | 5f736967 | 6e616c5f | 61737369 |

```
1333560  676e6d65 6e745f73 746d7400 b4640000 000caf80 000ced4c ffffffff 03003fc7 00002c07 0000000c 000dd478 000dd478
1333640  00010055 00000000 2aa80000 000ced78 000cafd8 001c636f 64706f6e 656e745f 696e7374 616e7469 6174696f 6e5f7374
1333720  6d740000 b4640000 000cb028 000ceda0 0007f41c 03003fcf 00002c07 0000000c 000e485c 000e485c 00010058 00000000
1334000  2aa80000 000cedcc 000cb080 0019636f 6e637572 72656e74 5f70726f 63656475 72655f63 616c6c00 b4640000 000cb0d0
1334060  000cedd8 ffffffff 03003fd7 00002c07 0000000c 000d05a0 000d05a0 0001004f 00000000 2b240000 0002438a 000cb128
1334140  b4640000 000cb178 000cee2c 0007e8dc 03003fe7 00002c07 0000000c 000cf184 000cf184 0001004f 00000000 2cac0000
1334220  0002438a 2ca00000 00000000 00000001 000cb21c 000cb2e0 0002438a 000cee28 000ca0b4 b4640000 000cb2b4 000cee44
1334300  2b240000 0002438a 000cb2f0 b4640000 000cb31c 000cee78 2cac0000 0002438a 2ca00000 00000000 00000001 000cb398
1334360  000cb9e4 0002438a 000cee74 000c8c0c b4640000 000cb3f4 000cee90 2aa80000 000cee9c 000cb44c b4640000 000cb49c
1334440  000ceea8 2aa80000 000ceeb4 000cb4f4 b4640000 000cb544 000ceec0 2aa80000 000ceecc 000cb5c0 b4640000 000cb654
1334520  000ceed8 2aa80000 000ceee4 000cb6ac b4640000 000cb6fc 000ceef0 2aa80000 000ceefc 000cb754 b4640000 000cb7a4
1334600  000cef08 2aa80000 000cef14 000cb7fc b4640000 000cb84c 000cef20 2aa80000 000cef2c 000cb8a4 b4640000 000cb8f4
1334660  000cef38 2aa80000 000cef44 000cb94c b4640000 000cb99c 000cef50 2b240000 0002438a 000cb9f4 b4640000 000cba44
1334740  000cef84 2cac0000 0002438a 2ca00000 00000000 00000001 000cbae8 000cbbac 0002438a 000cef80 000c8b44 b4640000
1335020  000cbb80 000cefb0 2b240000 0002438a 000cbbbc 00117375 6270726f 675f6465 636c5f73 70656300 b4640000 000cbbe8
1335100  000cf07c ffffffff 03003fdf 00002c07 0000000c 000cf108 000cf108 0001004f 00000000 2cac0000 0002438a 2ca00000
1335160  00000000 00000001 000cbc68 000cbc68 0002438a 000cf030 000cbc74 00106664 65636c5f 64657369 676e6174 6f720000
1335240  0011666f 726d616c 5f706172 616d5f6c 69737400 00087661 6c756564 65630000 00094675 6e637469 6f6e2000 00132072
1335320  65646566 696e6564 206f6e20 6c696e65 20000000 001c206e 6f742073 75666669 6369656e 746c7920 6f766572 6c6f6164
1335400  65640000 b4640000 000cbcc8 000cf130 0008005c 040036d7 00002c07 00000010 000e4c78 000e4c78 0001005a 00000000
1335460  ffffffff 03003fef 00002c07 0000000c 000cf4fc 000cf4fc 0001004f 00000000 ffffffff 040036df 00002c07 00000010
1335540  000e4d70 000e4d70 0001005a 00000000 ffffffff 03003c5f 00002c07 0000000c 000e0014 000e0014 00010056 00000000
1335620  2cac0000 0002438a 2ca00000 00000000 00000001 000cbea4 000b211c 0002438a 000cf12c 000c8840 b4640000 000cc130
1335700  000cf148 2aa80000 000cf154 000cc260 b4640000 000c819c 000cf160 2aa80000 000cf16c 000c82f4 b4640000 000c8544
1335760  000cf179 2b240000 0002438a 000b212c b4640000 000b22e4 000cf1ac 2cac0000 0002438a 2ca00000 00000000 00000001
1336040  000b2350 000b23d8 0002438a 000cf1a8 000c889c b4640000 000b23a0 000cf20c 000b84e4 05003767 00002c07 00000014
1336120  000e4e70 000e4e70 0001005a 00000000 2b240000 0002438a 000b23e8 00117375 6270726f 675f6465 636c5f70 61727400
1336200  00117375 6270726f 675f7374 6d745f70 61727400 b4640000 000b2430 000cf2a0 ffffffff 03004027 00002c07 0000000c
1336260  000cf2dc 000cf2dc 0001004f 00000000 ffffffff 0300402f 00002c07 0000000c 000cf540 000cf540 0001004f 00000000
1336340  0007f4bc 03004037 00002c07 0000000c 000cf784 000cf784 0001004f 00000000 2cac0000 0002438a 2ca00000 00000000
1336420  00000001 000b2548 000b2548 0002439a 000cf29c 000b2558 b4640000 000b26b0 000cf304 03003287 29c80000 000d4c60
1336500  000d1040 ffffffff 0300403f 00002c07 0000000c 000cf3f0 000cf3f0 0001004f 00000000 2cac0000 0002438a 2ca00000
1336560  00000000 00000001 000b2868 000c2b8c 0002438a 000cf300 000b2c38 b4640000 000b2af4 000cf354 2aa80000 000cf380
1336640  000c24c4 000b7064 65736967 6e61746f 72000000 000a5072 6f636564 75726520 00000000 00126c62 735f7072 6f636564
1336720  7572655f 626f6479 00000000 b4640000 000c26b4 000cf38c ffffffff 0300404f 00002c07 0000000c 000cf45c 000cf45c
1337000  0001004f 00000000 2aa80000 000cf398 000c2824 b4640000 000c2a6c 000cf3b4 2b240000 0002438a 000c2b9c 000c636f
1337060  6e636174 5f6e616d 65730000 b4640000 000c2d54 000cf418 03003287 29c80000 000d7510 000d398c ffffffff 03004067
1337140  00002c07 0000000c 000ed3b4 000ed3b4 0001005c 00000000 2cac0000 0002438a 2ca00000 00000000 00000001 000c2e24
1337220  000c2f98 0002438a 000cf414 000cf430 b4640000 000c2ed8 000cf440 2b240000 0002438a 000c2fa8 03003287 29c80000
1337300  000cf424 000c2e34 b4640000 000c3074 000cf484 03003287 29c80000 000d0610 000d0e5c 2cac0000 0002438a 2ca00000
1337360  00000000 00000001 000c3144 000c32b8 0002438a 000cf480 000cf49c b4640000 000c31f8 000cf4c0 2b240000 0002438a
1337440  000c32c8 03003287 29c80000 000cf490 000c3154 000e696e 74657266 6163655f 6c697374 00000000 b4640000 000c3394
1337520  000cf524 03003287 29c80000 000d4ccc 000d11c0 ffffffff 03004077 00002c07 0000000c 000cf894 000cf894 0001004f
1337600  00000000 2cac0000 0002438a 2ca00000 00000000 00000001 000c3444 000c3444 0002438a 000cf520 000c3450 b4640000
1337660  000c34e8 000cf598 03003287 29c80000 000d06a4 000cda2c 2cac0000 0002438a 2ca00000 00000000 00000001 000c354c
1337740  000c35f4 0002438a 000cf564 000cf5f0 00117375 6270726f 675f6465 636c5f69 74656d00 00176d6f 72655f73 75627072
1340020  6f675f64 65636c5f 69746564 73000000 b4640000 000c3588 000cf610 ffffffff 0300407f 00002c07 0000000c 000cf64c
1340100  000cf64c 0001004f 00000000 ffffffff 03004087 00002c07 0000000c 000cf718 000cf718 0001004f 00000000 2b240000
1340160  0002438a 000c3604 03003287 29c80000 000cf5e4 000c355c 000d7661 72696162 6c655f64 65636c00 b4640000 000c368c
1340240  000cf674 000d6465 7369676e 66696c65 2e706c00 ffffffff 0300408f 00002c07 0000000c 000dabf0 000dabf0 00010054
1340320  00000000 2cac0000 0002438a 2ca00000 00000000 00000001 000c378c 000c3b3c 0002438a 000cf670 000cf68c b4640000
1340400  000c37ec 000cf69c 2aa80000 000cf6a8 000c3844 03003287 29c80000 000cf680 000c379c b4640000 000c3894 000cf6b4
1340460  2aa80000 000cf6c0 000c3910 b4640000 000c39a4 000cf6cc 2aa80000 000cf6d8 000c39fc b4640000 000c3a4c 000cf6e4
1340540  2aa80000 000cf6f0 000c3aa4 b4640000 000c3af4 000cf6fc 2b240000 0002438a 000c3b4c b4640000 000c3b9c 000cf740
1340620  03003287 29c80000 000d06c8 000cd894 2cac0000 0002438a 2ca00000 00000000 00000001 000c3c40 000c3d04 0002438a
```

| | | | | | | | | | | | | |
|---|---|---|---|---|---|---|---|---|---|---|---|---|
| 1340700 | 000cf73c | 000cf758 | b4640000 | 000c1cd8 | 000cf768 | 2b240000 | 0002438a | 000c3d14 | 03003287 | 29c80000 | 000cf74c | 000c3c50 |
| 1340760 | b4640000 | 000c3d40 | 000cf7bc | 0000420f | b1280000 | 000d0888 | 00000000 | 2cac0000 | 0002438a | 2ca00000 | 00000000 | 00000001 |
| 1341040 | 000c3da4 | 000c3e2c | 0002438a | 000cf7a8 | 000cf7f4 | 000c7365 | 715f6f66 | 5f73746d | 74730000 | b4640000 | 000c3de0 | 000cf830 |
| 1341120 | ffffffff | 03004097 | 00002c07 | 0000000c | 000da170 | 000da170 | 00010054 | 00000000 | 2b240000 | 0002438a | 000c3e3c | 03003287 |
| 1341200 | 29c80000 | 000cf7e8 | 000c3db4 | 000f696e | 74657266 | 6163655f | 656c6d6e | 74000000 | 00156d6f | 72655f69 | 6e746572 | 66616365 |
| 1341260 | 5f656c6d | 6e747300 | b4640000 | 000c3e90 | 000cf8d0 | 000b656e | 74697479 | 5f646563 | 6c000000 | 000d502c | 000cf8f4 | 0007f51c |
| 1341340 | 0300409f | 00002c07 | 0000000c | 000cf91c | 000cf91c | 0001004f | 00000000 | ffffffff | 030040a7 | 00002c07 | 0000000c | 000cf9a0 |
| 1341420 | 000cf9a0 | 0001004f | 00000000 | 2cac0000 | 0002438a | 2ca00000 | 00000000 | 00000001 | 000c3f90 | 000c3f90 | 0002438a | 000cf8b8 |
| 1341500 | 000c3f9c | 000e696e | 74657266 | 6163655f | 6165636c | 00000000 | b4640000 | 000c40a4 | 000cf954 | 03003287 | 29c80000 | 000d06cc |
| 1341560 | 000cd71c | 0005706f | 72747300 | 000a0e34 | 00000000 | ffffffff | 030040af | 00002c07 | 0000000c | 000cfa3c | 000cfa3c | 0001004f |
| 1341640 | 00000000 | 2cac0000 | 0002438a | 2ca00000 | 00000000 | 00000001 | 000c4154 | 000c4154 | 0002438a | 000cf940 | 000c4160 | 000a7365 |
| 1341720 | 6169636f | 6c6f6e31 | 00000000 | b4640000 | 000c41f8 | 000cf9c8 | 000d556e | 74697479 | 5f686561 | 64657200 | 000d509c | 000cfa0c |
| 1342000 | 000d518c | 000bda38 | ffffffff | 040040b7 | 00002c07 | 00000010 | 000e4f64 | 000e4f64 | 0001005a | 00000000 | 2cac0000 | 0002438a |
| 1342060 | 2ca00000 | 00000000 | 00000001 | 000c8644 | 000c4350 | 0002438a | 000cf9c4 | 000cf9e0 | b4640000 | 000c4310 | 000cf9f0 | 2b240000 |
| 1342140 | 0002438a | 000c4360 | 03003287 | 29c80000 | 000cf9d4 | 000c8654 | b4640000 | 000cc44c | 000cfa7c | 03003287 | 29c80000 | 000d0728 |
| 1342220 | 000cd5bc | 000acaf8 | 00000000 | 00036964 | 73000000 | 0007f55c | 030040bf | 00002c07 | 0000000c | 000cfbe4 | 000cfbe4 | 0001004f |
| 1342300 | 00000000 | 2cac0000 | 0002438a | 2ca00000 | 00000000 | 00000001 | 000c6278 | 000b9998 | 0002438a | 000cfa60 | 000cfab4 | 0014696e |
| 1342360 | 74657266 | 6163655f | 636f6e73 | 745f6465 | 636c0000 | b4640000 | 000cc508 | 000cfb08 | 0007f59c | 030040c7 | 00002c07 | 0000000c |
| 1342440 | 000cfc54 | 000cfc54 | 0001004f | 00000000 | 2b240000 | 0002438a | 000b99a9 | 03003287 | 29c80000 | 000cfaa8 | 000c6284 | 000d7369 |
| 1342520 | 676e616c | 5f6f725f | 76617200 | 00066964 | 6c697374 | 00000000 | 0006636f | 6c6f6e31 | 00000000 | 0009766d | 6f64655f | 616c7400 |
| 1342600 | 000c6465 | 6661756c | 745f6578 | 70720000 | b4640000 | 000b9a44 | 000cfc18 | 0000420f | b128f61c | 000d08b4 | 00000000 | ffffffff |
| 1342660 | 030040cf | 00002c07 | 0000000c | 000cfcc0 | 000cfcc0 | 0001004f | 00000000 | ffffffff | 030040d7 | 00002c07 | 0000000c | 000d4ee0 |
| 1342740 | 000d4ee0 | 00010051 | 00000000 | ffffffff | 040040df | 00002c07 | 00000010 | 000e505c | 000e505c | 0001005a | 00000000 | 0007f5bc |
| 1343020 | 030040e7 | 00002c07 | 0000000c | 000cfd74 | 000cfd74 | 0001004f | 00000000 | 00080c5c | 03003c57 | 00002c07 | 0000000c | 000dff94 |
| 1343100 | 000dff94 | 00010056 | 00000000 | ffffffff | 030040ef | 00002c07 | 0000000c | 000db254 | 000db254 | 00010054 | 00000000 | 2cac0000 |
| 1343160 | 0002438a | 2ca00000 | 00000000 | 00000001 | 000b9c50 | 000b9c50 | 0002438a | 000cc578 | 000b766d | 6f64655f | 636f6e73 | 74000000 |
| 1343240 | b4640000 | 000b9f2c | 000cfc7c | 03003287 | 29c80000 | 000d0758 | 000cd36c | ffffffff | 030040f7 | 00002c07 | 0000000c | 000cfde0 |
| 1343320 | 000cfde0 | 0001004f | 00000000 | 2cac0000 | 0002438a | 2ca00000 | 00000000 | 00000001 | 000ba108 | 000ba53c | 0002438a | 000cfc78 |
| 1343400 | 000cfc94 | b4640000 | 000ba3a9 | 000cfca4 | 2b240000 | 0002438a | 000ba54c | 03003287 | 29c80000 | 000cfc88 | 000ba118 | b4640000 |
| 1343460 | 000ba7ac | 000cfce8 | 03003287 | 29c80000 | 000d75f0 | 000d3d34 | 2cac0000 | 0002438a | 2ca00000 | 00000000 | 00000001 | 000ba818 |
| 1343540 | 000ba928 | 0002438a | 000cfce4 | 000cfd00 | b4640000 | 000ba870 | 000cfd10 | 2aa80000 | 000cfd1c | 000ba8b4 | 03003287 | 29c80000 |
| 1343620 | 000cfcf4 | 000ba828 | b4640000 | 000ba8fc | 000cfd30 | 2b240000 | 0002438a | 000ba938 | 0005766d | 6f646500 | b4640000 | 000ba964 |
| 1343700 | 000cfd9c | 000b636f | 6e747874 | 5f697465 | 61000000 | 000d5120 | 000b7614 | 0007f5dc | 030040ff | 00002c07 | 0000000c | 000d4f60 |
| 1343760 | 000d4f60 | 00010051 | 00000000 | 2cac0000 | 0002438a | 2ca00000 | 00000000 | 00000001 | 000ba9e4 | 000baa70 | 0002438a | 000cfd98 |
| 1344040 | 000cfdb4 | b4640000 | 000baa44 | 000cfdc4 | 2b240000 | 0002438a | 000baa80 | 03003287 | 29c80000 | 000cfda8 | 000ba9f4 | b4640000 |
| 1344120 | 000baaac | 000cfe08 | 03003287 | 29c80000 | 000d077c | 000cd1ec | 2cac0000 | 0002438a | 2ca00000 | 00000000 | 00000001 | 000bab18 |
| 1344200 | 000bab9c | 0002438a | 000cfe04 | 000cfe20 | b4640000 | 000bab70 | 000cfe7c | 2b240000 | 0002438a | 000babac | 03003287 | 29c80000 |
| 1344260 | 000cfe14 | 000bab28 | 00107365 | 6e736974 | 69766974 | 795f6c69 | 73740000 | 00117072 | 6f636573 | 735f6465 | 636c5f70 | 61727400 |
| 1344340 | 00117072 | 6f636573 | 735f7374 | 6d745f70 | 61727400 | 000d656e | 645f7072 | 6f635f73 | 746d7400 | b4640000 | 000babd8 | 000cff70 |
| 1344420 | 0007f85c | 010042df | 00002c07 | 00000004 | 00094d4c | 00094d4c | 00010053 | 00000000 | ffffffff | 030022b7 | 00002c07 | 0000000c |
| 1344500 | 000d0448 | 000d0448 | 0001004f | 00000000 | 0007f5fc | 03004107 | 00002c07 | 0000000c | 000d0020 | 000d0020 | 0001004f | 00000000 |
| 1344560 | ffffffff | 0300410f | 00002c07 | 0000000c | 000d017c | 000d017c | 0001004f | 00000000 | ffffffff | 03004117 | 00002c07 | 0000000c |
| 1344640 | 000d02fc | 000d02fc | 0001004f | 00000000 | 0007f63c | 0300411f | 00002c07 | 0000000c | 000d03ac | 000d03ac | 0001004f | 00000000 |
| 1344720 | 2cac0000 | 0002438a | 2ca00000 | 00000000 | 00000001 | 000bad84 | 000bb100 | 0002438a | 000cff6c | 000cff88 | b4640000 | 000bafd0 |
| 1345000 | 000cffc4 | 2b240000 | 0002438a | 000bb110 | 03003287 | 29c80000 | 000cff7c | 000bad94 | 000a6d6f | 72655f6e | 616d6573 | 00000000 |
| 1345060 | 0006656e | 636f6465 | 00000000 | 000b7365 | 6e736974 | 69766974 | 79000000 | b4640000 | 000bb2d0 | 000d0054 | 000a6d6f | 72655f74 |
| 1345140 | 65726d73 | 00000000 | 0007fcbc | 030024ff | 00002c07 | 0000000c | 000e00f4 | 000e00f4 | 00010056 | 00000000 | ffffffff | 03004127 |
| 1345220 | 00002c07 | 0000000c | 000d00a0 | 000d00a0 | 0001004f | 00000000 | 2cac0000 | 0002438a | 2ca00000 | 00000000 | 00000001 | 000bb3d0 |
| 1345300 | 000bb3d0 | 0002438a | 000d0044 | 000bb3dc | 0006636f | 6d6d6131 | 00000000 | b4640000 | 000c0154 | 000d00c8 | 000a6765 | 6e657269 |
| 1345360 | 635f636c | 00000000 | 03003287 | 29c80010 | 000d8078 | 000af3b4 | ffffffff | 0400413f | 00002c07 | 00000010 | 000e51d4 | 000e51d4 |
| 1345440 | 0001005a | 00000000 | 2cac0000 | 0002438a | 2ca00000 | 00000000 | 00000001 | 000c025c | 000c03ac | 0002438a | 000d00c4 | 000d00e0 |
| 1345520 | b4640000 | 000c037c | 000d0120 | 2b240000 | 0002438a | 000c03bc | 03003287 | 29c80000 | 000d00d4 | 000c026c | 00117072 | 6f636573 |
| 1345600 | 735f6465 | 636c5f69 | 74656d00 | 00176d6f | 72655f70 | 726f6365 | 73735f64 | 65636c5f | 6974656d | 73000000 | b4640000 | 000c03e8 |
| 1345660 | 000d01a4 | 03003287 | 29c80000 | 000d0668 | 000d0c88 | ffffffff | 03004147 | 00002c07 | 0000000c | 000d01e8 | 000d01e8 | 0001004f |
| 1345740 | 00000000 | ffffffff | 0300414f | 00002c07 | 0000000c | 000d0340 | 000d0340 | 0001004f | 00000000 | 2cac0000 | 0002438a | 2ca00000 |

| | | | | | | | | | | | | |
|---|---|---|---|---|---|---|---|---|---|---|---|---|
| 1346020 | 00000000 | 00000001 | 000c048c | 000c0550 | 0002438a | 000d01a0 | 000d01bc | b4640000 | 000c0524 | 000d01cc | 2b240000 | 0002438a |
| 1346100 | 000c0560 | 03003287 | 29c80000 | 000d01b0 | 000c049c | b4640000 | 000c058c | 000d0210 | 000b6974 | 65725f73 | 6168656d | 65000000 |
| 1346160 | 2cac0000 | 0002438a | 2ca00000 | 00000000 | 00000001 | 000c370c | 000c0c60 | 0002438a | 000d020c | 000d0228 | b4640000 | 000c0718 |
| 1346240 | 000d0238 | 2aa80000 | 000d0244 | 000c0794 | 03003287 | 29c80000 | 000d021c | 000c371c | b4640000 | 000c0828 | 000d0250 | 2aa80000 |
| 1346320 | 000d025c | 000c0880 | b4640000 | 000c08d0 | 000d0268 | 2aa80000 | 000d0274 | 000c0928 | b4640000 | 000c0978 | 000d0280 | 2aa80000 |
| 1346400 | 000d028c | 000c09d0 | b4640000 | 000c0a20 | 000d0298 | 2aa80000 | 000d02a4 | 000c0a78 | b4640000 | 000c0ac8 | 000d02b0 | 2aa80000 |
| 1346460 | 000d02bc | 000c0b20 | b4640000 | 000c0b70 | 000d02c8 | 2aa80000 | 000d02d4 | 000c0bc8 | b4640000 | 000c0c18 | 000d02e0 | 2b240000 |
| 1346540 | 0002438a | 000c0c70 | b4640000 | 000c0cc0 | 000d0324 | 000d6572 | 725f7365 | 6d69636f | 6c6f6e00 | 2cac0000 | 0002438a | 2ca00000 |
| 1346620 | 00000000 | 00000001 | 000c0d44 | 000c0d44 | 0002438a | 000d0320 | 000c0d50 | b4640000 | 000c0da8 | 000d0368 | 0000419f | b3280000 |
| 1346700 | 000ccb9c | 00000000 | 2cac0000 | 0002438a | 2ca00000 | 00000000 | 00000001 | 000c0e4c | 000c0f10 | 0002438a | 000d0364 | 000d0380 |
| 1346760 | b4640000 | 000c0ee4 | 000d0390 | 2b240000 | 0002438a | 000c0f20 | 03003287 | 29c80000 | 000d0374 | 000c0e5c | b4640000 | 000c0f4c |
| 1347040 | 000d03d4 | 000c6465 | 7369676e | 5f756e69 | 74730000 | 2cac0000 | 0002438a | 2ca00000 | 00000000 | 00000001 | 000c1000 | 000c13a0 |
| 1347120 | 0002438a | 000d03d0 | 000d03ec | b4640000 | 000c10c8 | 000d03fc | 2aa80000 | 000d0408 | 000c116c | 03003287 | 29c80000 | 000d03e0 |
| 1347200 | 000c1010 | b4640000 | 000c122c | 000d0414 | 2aa80000 | 000d0420 | 000c1290 | b4640000 | 000c133c | 000d042c | 2b240000 | 0002438a |
| 1347260 | 000c13b0 | b4640000 | 000c1444 | 000d0480 | 000b7668 | 646c5f64 | 65736967 | 6e000000 | 2cac0000 | 0002438a | 2ca00000 | 00000000 |
| 1347340 | 00000001 | 000c14d8 | 000c1598 | 0002438a | 000d046c | 000d0498 | 000c6e65 | 61725f70 | 726f6365 | 73730000 | b4640000 | 000c1568 |
| 1347420 | 000d0564 | 2b240000 | 0002438a | 000c15a8 | 03003287 | 29c80000 | 000d048c | 000c14e8 | 000b666f | 756e645f | 636f6c6f | 6e000000 |
| 1347500 | 000b852c | 020031e7 | 00002c07 | 00000008 | 000939e0 | 000c1624 | 00030000 | 00000000 | 000db290 | 01003717 | b4640000 | 000c15d8 |
| 1347560 | 000d0530 | ffffffff | 04003717 | 00002c07 | 00000010 | 000c1680 | 000c1704 | 0001004f | 00000000 | 0000419f | b3280000 | 000ccb70 |
| 1347640 | 00000000 | 000e666f | 756e645f | 6e6f5f63 | 6f6c6f6e | 00000000 | b4640000 | 000c16cc | 00000000 | 000a6173 | 736f635f | 6c697374 |
| 1347720 | 00000000 | 0015556e | 6465636c | 61726564 | 2070726f | 63656475 | 72652000 | b4640000 | 000c1750 | 000d05c8 | 000a6465 | 7369676e |
| 1350000 | 65696c65 | 00000000 | ffffffff | 03004177 | 00002c07 | 0000000c | 000e26a8 | 000e26a8 | 00010057 | 00000000 | 2cac0000 | 0002438a |
| 1350060 | 2ca00000 | 00000000 | 00000001 | 000c18a0 | 000c1b7c | 0002438a | 000d05c4 | 000d05e0 | b4640000 | 000c1a98 | 000d07c4 | 2b240000 |
| 1350140 | 0002438a | 000c1b8c | 03003287 | 29c80000 | 000d05d4 | 000c18b0 | b4640000 | 000d0f8c | 000d4c54 | 0010656e | 74697479 | 5f646563 |
| 1350220 | 6c5f6974 | 656d0000 | 2b2405f4 | 0002438a | 000d0f04 | 000e7175 | 616c6966 | 6965645f | 65787072 | 00000000 | 000ccff0 | 000ccd6c |
| 1350300 | b4640648 | 000d0920 | 000d0650 | 0007706f | 72745f63 | 6c000638 | b4640660 | 000d0bf8 | 000d065c | b464066c | 000d0cd8 | 000d0674 |
| 1350360 | 2aa80678 | 000d0680 | 000d0d30 | b4640684 | 000d0d80 | 000d068c | 2b240690 | 0002438a | 000d0dbc | b464069c | 000d0de8 | 000d0698 |
| 1350440 | b4640614 | 000d0e88 | 000d05f0 | 2b24069c | 0002438a | 000cdac4 | b46406a8 | 000cda74 | 000d0638 | b46406b4 | 000cd964 | 000d06b0 |
| 1350520 | 2b2406c0 | 0002438a | 000cd91c | b46406cc | 000cd8cc | 000d06bc | b46406d8 | 000cd7fc | 000d06d4 | 2b2406e4 | 0002438a | 000cd7b4 |
| 1350600 | b46406f0 | 000cd764 | 000d06e0 | 00087365 | 635f756e | 69740010 | b4640708 | 000cd694 | 000d06f8 | 00097072 | 696d5f75 | 6e697400 |
| 1350660 | 2b240720 | 0002438a | 000cd66c | b464072c | 000cd634 | 000d0710 | b4640738 | 000cd514 | 000d0734 | b4640744 | 000cd444 | 000d0740 |
| 1350740 | 2b240750 | 0002438a | 000cd41c | b464075c | 000cd3e4 | 000d074c | b4640768 | 000cd2c4 | 000d0764 | 2b240774 | 0002438a | 000cd29c |
| 1351020 | b4640780 | 000cd264 | 000d0770 | b464078c | 000cd144 | 000d0788 | b4640798 | 000ccec0 | 000d0794 | 00086c69 | 625f756e | 697400b8 |
| 1351100 | 0009636f | 6e747874 | 5f636c00 | b46407bc | 000ccc08 | 000d07a0 | 00096572 | 725f636f | 6c6f6e00 | 00076172 | 63682e70 | 6c0007e8 |
| 1351160 | 000d08ec | 0000002c | b288b66c | 00000377 | 7fffffff | 000c6318 | 02000ce5 | 0100147d | 01002d65 | 0000000b | 00002aff | 002e2f68 |
| 1351240 | 6f6d652f | 6f736173 | 312f612f | 73726565 | 2f73656d | 616e7469 | 635f6368 | 65636b31 | 2f656e74 | 6974795f | 6465636c | 0009097b |
| 1351320 | 00312f68 | 6f6d652f | 6f736173 | 312f612f | 73726565 | 2f73656d | 616e7469 | 635f6368 | 65636b31 | 2f656e74 | 6974795f | 6465636c |
| 1351400 | 2e706c00 | 0000002c | 000d2b5c | b27cb66c | 00000379 | 7fffffff | 000ccb6c | 02000ce5 | 0200293d | 0000420f | 0000028b | 00002aff |
| 1351460 | 0000002c | 000d2b88 | b27cb66c | 000003b3 | 7fffffff | 000ccb98 | 02000ce5 | 02001f6d | 0000420f | 00002c07 | 00002aff | 000e656e |
| 1351540 | 74697479 | 5f646563 | 6c2e706c | 00000000 | 000d0a24 | 0000002c | b27cb66c | 0000037b | 000003b2 | 0009cbc1 | 02000ce5 | 02002385 |
| 1351620 | 0000420f | 00002c07 | 00002aff | 0000010c | 000cda70 | b27cb66c | 0000037c | 7fffffff | 000d0bf4 | 02000ce5 | 020031ed | 020031e5 |
| 1351700 | 000041f7 | 02000a3d | 02003645 | 0000343f | 0000000c | 02000a3d | 02003645 | 00000010 | 00000014 | 02000a3d | 02003645 | 0000226f |
| 1351760 | 00000018 | 02000a3d | 0000083f | 02000a3d | 02000885 | 00004217 | 0000001c | 02000a3d | 02000885 | 0000421f | 00000020 | 02000a3d |
| 1352040 | 02000885 | 00003ea7 | 00000024 | 02000a3d | 01002d65 | 03003ea1 | 0000343f | 00000012 | 00000028 | 0000083f | 020031f5 | 00003ebf |
| 1352120 | 02000a3d | 02000cdd | 0000002a | 01001b75 | 01003d3d | 0000000e | 02000a3d | 02000885 | 0000001e | 01003ebd | 0000002a | 02000a3d |
| 1352200 | 02000885 | 00000022 | 01003ebd | 0000002a | 02000885 | 00000026 | 02003eb1 | 00000012 | 00000016 | 00002aff | 000d0c44 | 00000064 |
| 1352260 | b27cb66c | 0000037d | 000003b4 | 000d0c49 | 02000ce5 | 05001b0d | 000041f7 | 0000001b | 00002c07 | 00695483 | 0000028b | 00002aff |
| 1352340 | 000d0c44 | 0000002c | b4f0b4e4 | 0000037c | 7fffffff | 0007eaad | 00000000 | 00000000 | 000ce328 | 0002438a | 000d52c8 | 2c780168 |
| 1352420 | 0002438a | 5d100000 | 03003287 | 4b8c0000 | 000041f7 | 64205818 | 67ec001c | 55f0687c | 003c55f0 | 6af00030 | 55f06af0 | 002855f0 |
| 1352500 | 6af00020 | 55f06a50 | 537056f8 | 671c5370 | 51100000 | 020031f7 | 4b8c0000 | 00003ebf | 5a180000 | 02000a3f | 60cc5aec | 02000cdf |
| 1352560 | 6a0058e0 | 01001b77 | 5a180000 | 01003d3f | 671c5c30 | 02000a3f | 66700018 | 5c9c0018 | 02000887 | 6e580028 | 5a180000 | 01003ebf |
| 1352640 | 6d805c30 | 02000a3f | 66700018 | 5c9c0018 | 02000887 | 6e580020 | 5a180000 | 01003ebf | 6d805c30 | 02000887 | 6dc458e0 | 02003ebf |
| 1352720 | 69b06af0 | 003836a4 | 4790001c | 35400018 | 00403678 | 001c35c8 | 43000000 | 0000343f | 000cc5cc | 00443540 | 00180034 | 3f680040 |
| 1353000 | 3894003c | 382c0038 | 3b4c0000 | 000cc5cc | 00383540 | 0018002c | 3f680034 | 38940030 | 320c42ac | 0000226f | 000cc5cc | 00302ecc |
| 1353060 | 34100024 | 3e70002c | 3af40028 | 000d29b8 | 002833f4 | 3e700024 | 3af40020 | 000d4b10 | 00203894 | 001c3d48 | 3bf40000 | 000cc60c |

| | | | | | | | | | | | | |
|---|---|---|---|---|---|---|---|---|---|---|---|---|
| 1353140 | 00143858 | 37dc42ac | 0000343f | 000cc62c | 000c2eb0 | 00000054 | 000d091c | b27cb66c | 0000037e | 7fffffff | 000d0cd4 | 02000ce5 |
| 1353220 | 020031ed | 020031e5 | 00004217 | 02000885 | 00004227 | 0000000c | 020031f5 | 01003ebd | 00000010 | 02000885 | 0000000e | 01003ebd |
| 1353300 | 00000012 | 00002aff | 000d0e18 | 00000038 | b27cb66c | 0000037f | 000003b5 | 000d0e1c | 02000ce5 | 05001b0d | 00004217 | 0000001b |
| 1353360 | 00002c07 | 00694dc3 | 0000028b | 00002aff | 27f00054 | 000d0d20 | 54100000 | 03003287 | 4b8c0000 | 00004217 | 60cc56f8 | 671c5370 |
| 1353440 | 581867b8 | 53705c30 | 020031f7 | 65300018 | 5e540000 | 01003ebf | 67b85ec0 | 00000018 | 02000887 | 6b7458e0 | 01003ebf | 6c3422bc |
| 1353520 | 000d4b54 | 00000054 | 000d0bf4 | b27cb66c | 00000380 | 7fffffff | 000d0d7c | 02000ce5 | 020031ed | 020031e5 | 00004217 | 02000885 |
| 1353600 | 0000422f | 0000000c | 020031f5 | 01003ebd | 00000010 | 02000885 | 0000000e | 01003ebd | 00000012 | 00002aff | 28c40054 | 000d0dac |
| 1353660 | 51100000 | 03003287 | 4b8c0000 | 00004217 | 60cc56f8 | 671c5370 | 581867b8 | 53705c30 | 020031f7 | 65300018 | 5e540000 | 01003ebf |
| 1353740 | 67b85ec0 | 00000018 | 02000887 | 6b7458e0 | 01003ebf | 6c3422bc | 000d4b98 | 00000038 | 000d0cd8 | b27cb66c | 00000381 | 7fffffff |
| 1354020 | 000d0de4 | 02000ce5 | 020031ed | 020031e5 | 00004217 | 00000007 | 01003ebd | 0000000c | 00002aff | 2954002e | 0002438a | 5d100000 |
| 1354100 | 01003287 | 4b8c0000 | 00004217 | 537055f0 | 671c5370 | 5d100000 | 01003ebf | 5fa04960 | 228c2d20 | 00000038 | 000d0d7c | b27cb66c |
| 1354160 | 00000382 | 7fffffff | 000d0e84 | 02000ce5 | 020031ed | 020031e5 | 0000421f | 00000007 | 01003ebd | 0000000c | 00002aff | 000d0ffc |
| 1354240 | 00000038 | b27cb66c | 00000383 | 000003b6 | 000d1000 | 02000ce5 | 05001b0d | 0000421f | 0000001b | 00002c07 | 006a5883 | 0000028b |
| 1354320 | 00002aff | 27f0002e | 000d0ef4 | 5d100000 | 03003287 | 4b8c0000 | 0000421f | 537055f0 | 671c5370 | 5d100000 | 01003ebf | 5fa04960 |
| 1354400 | 228c3c2d | 00000078 | 000d0de4 | b27cb66c | 00000384 | 7fffffff | 000d0f88 | 02000ce5 | 020031ed | 020031e5 | 0000421f | 02000a3d |
| 1354460 | 02000885 | 00004237 | 0000000c | 02000885 | 0000423f | 00000010 | 020031f5 | 01003ebd | 00000014 | 02000a3d | 02000885 | 0000000e |
| 1354540 | 01003ebd | 00000016 | 02000885 | 00000012 | 01003ebd | 00000016 | 00002aff | 2954008c | 0002438a | 5d100000 | 03003287 | 4b8c0000 |
| 1354620 | 0000421f | 60cc56f8 | 671c55f0 | 682c5370 | 581867b8 | 53705c30 | 020031f7 | 65300018 | 5e540000 | 01003ebf | 67b85ec0 | 00000018 |
| 1354700 | 02000a3f | 66c0001c | 00185ec0 | 0000001c | 02000887 | 6b7458e0 | 01003ebf | 6c345ec0 | 00000018 | 02000887 | 6d3c58e0 | 01003ebf |
| 1354760 | 6c344768 | 33bc247c | 000d4bfc | 0018386c | 34302340 | 000d4c1c | 00000079 | 000d0e84 | b27cb66c | 00000385 | 7fffffff | 000d10c4 |
| 1355040 | 02000ce5 | 020031ed | 020031e5 | 0000423f | 02000a3d | 02000885 | 00004237 | 0000000c | 02000885 | 0000423f | 00000010 | 020031f5 |
| 1355120 | 01003ebd | 00000014 | 02000a3d | 02000885 | 0000000e | 01003ebd | 00000016 | 02000885 | 00000012 | 01003ebd | 00000016 | 00002aff |
| 1355200 | 000d117c | 00000038 | b27cb66c | 00000386 | 000003b7 | 000d1180 | 02000ce5 | 05001b0d | 0000423f | 0000001b | 00002c07 | 006a60e3 |
| 1355260 | 0000028b | 00002aff | 27f0008c | 000d10f4 | 51100000 | 03003287 | 4b8c0000 | 0000423f | 60cc56f8 | 671c55f0 | 682c5370 | 581867b8 |
| 1355340 | 53705c30 | 020031f7 | 65300018 | 5e540000 | 01003ebf | 67b85ec0 | 00000018 | 02000a3f | 66c0001c | 00185ec0 | 0000001c | 02000887 |
| 1355420 | 6b7458e0 | 01003ebf | 6c345ec0 | 00000018 | 02000887 | 6d3c58e0 | 01003ebf | 6c344768 | 33bc247c | 000d4bfc | 0018386c | 34302340 |
| 1355500 | 000d4c1c | 00000038 | 000d0f88 | b27cb66c | 00000387 | 7fffffff | 000d112c | 02000ce5 | 020031ed | 020031e5 | 0000423f | 00000007 |
| 1355560 | 01003ebd | 0000000c | 00002aff | 2954002e | 0002438a | 5d100000 | 03003287 | 4b8c0000 | 0000423f | 537055f0 | 671c5370 | 5d100000 |
| 1355640 | 01003ebf | 5fa04960 | 228c0000 | 00000054 | 000d10c4 | b27cb66c | 00000388 | 7fffffff | 000d120c | 02000ce5 | 020031ed | 020031e5 |
| 1355720 | 00004237 | 02000885 | 00003ee7 | 0000000c | 020031f5 | 01003ebd | 00000010 | 02000885 | 0000000e | 01003ebd | 00000012 | 00002aff |
| 1356000 | 000d17d8 | 00000038 | b27cb66c | 00000389 | 000003b8 | 000d17dc | 02000ce5 | 05001b0d | 00004237 | 0000001b | 00002c07 | 006a5fe3 |
| 1356060 | 0000028b | 00002aff | 27f00054 | 000d1258 | 5d100000 | 03003287 | 4b8c0000 | 00004237 | 60cc56f8 | 671c5370 | 581867b8 | 53705c30 |
| 1356140 | 020031f7 | 65300018 | 5e540000 | 01003ebf | 67b85ec0 | 00000018 | 02000887 | 6b7458e0 | 01003ebf | 6c3422bc | 000cc76c | 00000054 |
| 1356220 | 000d112c | b27cb66c | 0000038a | 7fffffff | 000d12b4 | 02000ce5 | 020031ed | 020031e5 | 00004237 | 02000885 | 00003f4f | 0000000c |
| 1356300 | 020031f5 | 01003ebd | 00000010 | 02000885 | 0000000e | 01003ebd | 00000012 | 00002aff | 28c40054 | 000d1300 | 5d100000 | 03003287 |
| 1356360 | 4b8c0000 | 00004237 | 60cc56f8 | 671c5370 | 581867b8 | 53705c30 | 020031f7 | 65300018 | 5e540000 | 01003ebf | 67b85ec0 | 00000018 |
| 1356440 | 02000887 | 6b7458e0 | 01003ebf | 6c3422bc | 000cc9c8 | 00000054 | 000d120c | b27cb66c | 0000038b | 7fffffff | 000d135c | 02000ce5 |
| 1356520 | 020031ed | 020031e5 | 00004237 | 02000885 | 00003ed7 | 0000000c | 020031f5 | 01003ebd | 00000010 | 02000885 | 0000000e | 01003ebd |
| 1356600 | 00000012 | 00002aff | 28c40054 | 000d13a8 | 51100000 | 03003287 | 4b8c0000 | 00004237 | 60cc56f8 | 671c5370 | 581867b8 | 53705c30 |
| 1356660 | 020031f7 | 65300018 | 5e540000 | 01003ebf | 67b85ec0 | 00000018 | 02000887 | 6b7458e0 | 01003ebf | 6c3422bc | 000cc704 | 00000054 |
| 1356740 | 000d12b4 | b27cb66c | 0000038c | 7fffffff | 000d1404 | 02000ce5 | 020031ed | 020031e5 | 00004237 | 02000885 | 00003edf | 0000000c |
| 1357020 | 020031f5 | 01003ebd | 00000010 | 02000885 | 0000000e | 01003ebd | 00000012 | 00002aff | 28c40054 | 000d1450 | 5d100000 | 03003287 |
| 1357100 | 4b8c0000 | 00004237 | 60cc56f8 | 671c5370 | 581867b8 | 53705c30 | 020031f7 | 65300018 | 5e540000 | 01003ebf | 67b85ec0 | 00000018 |
| 1357160 | 02000887 | 6b7458e0 | 01003ebf | 6c3422bc | 000cc74c | 00000054 | 000d135c | b27cb66c | 0000038d | 7fffffff | 000d14ac | 02000ce5 |
| 1357240 | 020031ed | 020031e5 | 00004237 | 02000885 | 00003eef | 0000000c | 020031f5 | 01003ebd | 00000010 | 02000885 | 0000000e | 01003ebd |
| 1357320 | 00000012 | 00002aff | 28c40054 | 000d14f8 | 51100000 | 03003287 | 4b8c0000 | 00004237 | 60cc56f8 | 671c5370 | 581867b8 | 53705c30 |
| 1357400 | 020031f7 | 65300018 | 5e540000 | 01003ebf | 67b85ec0 | 00000018 | 02000887 | 6b7458e0 | 01003ebf | 6c3422bc | 000cc78c | 00000054 |
| 1357460 | 000d1404 | b27cb66c | 0000038e | 7fffffff | 000d1554 | 02000ce5 | 020031ed | 020031e5 | 00004237 | 02000885 | 00003ef7 | 0000000c |
| 1357540 | 020031f5 | 01003ebd | 00000010 | 02000885 | 0000000e | 01003ebd | 00000012 | 00002aff | 28c40054 | 000d15a0 | 5d100000 | 03003287 |
| 1357620 | 4b8c0000 | 00004237 | 60cc56f8 | 671c5370 | 531867b8 | 53705c30 | 020031f7 | 65300018 | 5e540000 | 01003ebf | 67b85ec0 | 00000018 |
| 1357700 | 02000887 | 6b7458e0 | 01003ebf | 6c3422bc | 000cc7ac | 00000054 | 000d14ac | b27cb66c | 0000038f | 7fffffff | 000d15fc | 02000ce5 |
| 1357760 | 020031ed | 020031e5 | 00004237 | 02000885 | 00003f07 | 0000000c | 020031f5 | 01003ebd | 00000010 | 02000885 | 0000000e | 01003ebd |
| 1360040 | 00000012 | 00002aff | 28c40054 | 000d1648 | 54100000 | 03003287 | 4b8c0000 | 00004237 | 60cc56f8 | 671c5370 | 581867b8 | 53705c30 |
| 1360120 | 020031f7 | 65300018 | 5e540000 | 01003ebf | 67b85ec0 | 00000018 | 02000887 | 6b7458e0 | 01003ebf | 6c3422bc | 000cc800 | 00000054 |
| 1360200 | 000d1554 | b27cb66c | 00000390 | 7fffffff | 000d16a4 | 02000ce5 | 020031ed | 020031e5 | 00004237 | 02000885 | 00003f0f | 0000000c |

```
1360260 020031f5 01003ebd 00000010 02000885 0000000e 01003ebd 00000012 00002aff 28c40054 000d16f0 5d100000 03003287
1360340 4b8c0000 00004237 60cc56f8 671c5370 581867b8 53705c30 020031f7 65300018 5e540000 01003ebf 67b85ec0 00000018
1360420 02000887 6b7458e0 01003ebf 6c3422bc 000cc820 00000054 000d15fc b27cb66c 00000391 7fffffff 000d174c 02000ce5
1360500 020031ed 020031e5 00004237 02000885 00003f17 0000000c 020031f5 01003ebd 00000010 02000885 0000000e 01003ebd
1360560 00000012 00002aff 29540054 0002438a 5d100000 03003287 4b8c0000 00004237 60cc56f8 671c5370 581867b8 53705c30
1360640 020031f7 65300018 5e540000 01003ebf 67b85ec0 00000018 02000887 6b7458e0 01003ebf 6c3422bc 000cc840 00000090
1360720 000d16a4 b27cb66c 00000392 7fffffff 000d18e8 02000ce5 020031ed 020031e5 00004227 02000a3d 02003645 000034b7
1361000 0000000c 02000a3d 0000083f 02000a3d 010036d5 00000010 02000a3d 02000885 00004247 00000014 02000a3d 010036dd
1361060 00000018 0100371d 0000001a 020031f5 01003ebd 0000001c 02000885 00000016 01003ebd 0000001e 00002aff 000d195c
1361140 00000038 b27cb66c 00000393 000003b9 000d1960 02000ce5 05001b0d 00004227 0000001b 00002c07 006a5aa3 0000028b
1361220 00002aff 2c7800d4 0002438a 5d100000 03003287 4b8c0000 00004227 60cc56f8 671c55f0 687c002c 55f06af0 002455f0
1361300 6af0001c 55f06a00 53705818 67b85370 5e540000 020031f7 65300018 5e540000 01003ebf 67b85ec0 00000018 02000887
1361360 6e580024 5a180000 01003ebf 6c3436a8 477c3540 00180030 362c320c 43000000 000034b7 000cc5cc 00342ecc 34a00028
1361440 3eec0030 382c002c 31f0247c 000cf098 002c3410 00203e70 00283c9c 00000024 000d4da8 00243468 3eec0020 382c001c
1361520 3280247c 000cf0d8 001c38e8 3d6c37f0 3cf4234c 000cc8c0 00000078 000d174c b27cb66c 00000394 7fffffff 000d1a24
1361600 02000ce5 020031ed 020031e5 00004247 02000a3d 02000885 000034b7 0000000c 02000885 0000424f 00000010 020031f5
1361660 01003ebd 00000014 02000a3d 02000885 0000000e 01003ebd 00000016 02000885 00000012 01003ebd 00000016 00002aff
1361740 000d1b40 00000038 b27cb66c 00000395 000003ba 000d1b44 02000ce5 05001b0d 00004247 0000001b 00002c07 006a6d43
1362020 0000028b 00002aff 2c78008c 0002438a 5d100000 03003287 4b8c0000 00004247 60cc56f8 671c55f0 682c5370 581867b8
1362100 53705c30 020031f7 65300018 5e540000 01003ebf 67b85ec0 00000018 02000a3f 66c0001c 00185ec0 0000001c 02000887
1362160 6b7458e0 01003ebf 6c345ec0 00000018 02000887 6d3c58e0 01003ebf 6c344768 33bc247c 000d4dfc 0018386c 3d302340
1362240 000d4e1c 00000120 000d18e8 b27cb66c 00000396 7fffffff 000d1d10 02000ce5 020031ed 020031e5 000034b7 02000a3d
1362320 02000885 000040d7 0000000c 02000a3d 010040dd 00000010 02000a3d 02000885 000040ff 00000014 02000a3d 02000885
1362400 00003c57 00000018 02000885 000040ef 0000001c 020031f5 01003ebd 00000020 02000a3d 02000885 0000000e 02003ebd
1362460 00000022 00000024 02000a3d 02000885 00000016 01003ff5 00000028 02000a3d 02000885 0000001a 02004005 00000022
1362540 0000002c 02000a3d 0000083f 02000a3d 02000885 0000001e 02003ff5 00000022 00000030 02000a3d 0000083f 03003ab5
1362620 00000022 00000012 03003abd 00000026 00000001 000034b7 00000001 0000002a 00000001 0000002e 00000007 00000032
1362700 00002aff 000d1d90 00000038 b27cb66c 00000397 000003bb 000d1d94 02000ce5 05001b0d 000034b7 0000001b 00002c07
1362760 006a6fe3 0000028b 00002aff 2c780194 0002438a 5d100000 03003287 4b8c0000 000034b7 60cc56f8 671c55f0 687c002c
1363040 55f06af0 002055f0 6aa055f0 69b05370 581867b8 53705c30 020031f7 66700018 5c9c0018 01003ebf 67ec0024 5e540000
1363120 02000a3f 66700018 5c9c0018 02000887 6b7458e0 02003ebf 6c840024 67ec001c 5e540000 02000a3f 66700018 5c9c0018
1363200 02000887 6e580020 5a180000 01003ff7 67ec0018 5e540000 02000a3f 65300020 5e540000 02000887 6e0858e0 02004007
1363260 6c840024 67b85ec0 00000020 02000a3f 4b8c0000 0000083f 5a180000 02000a3f 66c00020 00285ec0 00000020 02000887
1363340 6d3c58e0 02003ff7 6c840024 67ec0020 5c9c0028 02000a3f 4b8c0000 0000083f 5a180000 03003ab7 6c840024 6af00028
1363420 5a180000 03003abf 6c84001c 67ec001c 6c840020 5878001c 4b8c0000 000034b7 55f06c84 001855f0 6c345370 47683410
1363500 0030247c 000cfb54 003434a0 00243eec 0030382c 002c3c9c 00000028 000cfb74 00283410 001c3e70 00243c9c 00000020
1363560 000cfd64 002033bc 3e70001c 3c480000 000cfbb4 0018386c 3d302340 000cfbd4 00000084 000d1a24 b27cb66c 00000398
1363640 7fffffff 000d1eb4 02000ce5 020031ed 020031e5 0000424f 02000a3d 010040b5 0000000c 02000a3d 02000885 000034b7
1363720 00000010 02000885 0000424f 00000014 020031f5 01003ebd 00000018 02000a3d 02000885 00000012 01003ebd 0000001a
1364000 02000885 00000016 01003ebd 0000001a 00002aff 000d1fa4 00000078 b27cb66c 00000399 000003bc 000d1fa8 02000ce5
1364060 05001b0d 0000424f 0000001b 00002c07 006a70e3 0000028b 00002aff 000d1fa4 00000040 00000000 00000000 00000000
1364140 000bda39 00000000 00000000 00000000 000c8bc4 000cfd44 00000000 00000000 000d509c 000d518c 000c9c34 27f000a8
1364220 000d1ee4 5d100000 03003287 4b8c0000 0000424f 60cc56f8 671c55f0 686855f0 69b05370 581867b8 53705c30 020031f7
1364300 65300018 5e540000 01003ebf 67b85ec0 00000018 02000a3f 66c0001c 00185ec0 0000001c 02000887 6e0858e0 01003ebf
1364360 6c345ec0 00000018 02000887 6d3c58e0 01003ebf 6c344768 34a0001c 364035c8 31f0247c 000cf990 002033bc 3e70001c
1364440 3c480000 000d4dfc 0018386c 3d302340 000d4e1c 00000038 000d1d10 b27cb66c 0000039a 7fffffff 000d1f1c 02000ce5
1364520 020031ed 020031e5 0000424f 00000007 01003ebd 0000000c 00002aff 2954002e 0002438a 5d100000 03003287 4b8c0000
1364600 0000424f 537055f0 671c5370 5d100000 01003ebf 5fa04960 228c0000 0000008c 000d1eb4 b27cb66c 0000039b 7fffffff
1364660 000d2094 02000ce5 020031ed 020031e5 000040d7 02000a3d 02003645 0000000c 00000010 02000885 00004257 00000014
1364740 020031f5 02003ebd 00000014 00000001 0000000e 0000001c 02000d04 02000a3d 02003f35 0000000e 00000012 00001f17
1365020 02000885 00000016 02003ebd 0000001a 0000001e 00002aff 000d2128 00000038 b27cb66c 0000039c 000003bd 000d212c
1365100 02000ce5 05001b0d 000040d7 0000001b 00002c07 0067daa3 0000028b 00002aff 2c7800b4 0002438a 5d100000 03003287
1365160 4b8c0000 000040d7 64205818 67ec0020 55f0682c 537056f8 671c5370 5d100000 020031f7 6110001c 5d100000 02003ebf
1365240 67ec0018 55f060cc 5c9c001c 02000d0f 66c0001c 00245ec0 0000001c 02000a3f 67ec001c 4b8c0000 00001f17 5c9c001c
1365320 02003f37 6b7467ec 001c5ec0 00000024 02000887 6d3c58e0 02003ebf 6c840018 6c3416a4 476834e0 00183678 00203614
```

| | | | | | | | | | | | | |
|---|---|---|---|---|---|---|---|---|---|---|---|---|
| 1365400 | 001c247c | 000cc5cc | 0018386c | 3d302340 | 000d4c88 | 00000098 | 000d1f1c | b27cb66c | 0000039d | 7fffffff | 000d2234 | 02000ce5 |
| 1365460 | 020031ed | 020031e5 | 00004257 | 02000a3d | 0100413d | 0000000c | 02000a3d | 02003645 | 00000010 | 00000014 | 02000885 | 00004257 |
| 1365540 | 00000018 | 020031f5 | 02003eb1 | 0000001c | 00000001 | 00000012 | 00000020 | 02000d0d | 02000a3d | 02003f35 | 00000012 | 00000016 |
| 1365620 | 00001f17 | 02000885 | 0000001a | 02003ebd | 0000001e | 00000022 | 00002aff | 000d22dc | 00000038 | b27cb66c | 0000039e | 000003be |
| 1365700 | 000d22e0 | 02000ce5 | 05001b0d | 00004257 | 0000001b | 00002c07 | 006a6443 | 0000028b | 00002aff | 27f000d0 | 000d2269 | 5d100000 |
| 1365760 | 03003287 | 4b8c0000 | 00004257 | 60cc56f8 | 671c55f0 | 687c0020 | 55f069b0 | 53705818 | 67b85370 | 5e540000 | 020031f7 | 6530001c |
| 1366040 | 5e540000 | 02003ebf | 67ec0018 | 55f06aa0 | 67b85ec0 | 0000001c | 02000d0f | 66c00020 | 001c5ec0 | 00000020 | 02000a3f | 67ec0020 |
| 1366120 | 4b8c0000 | 00001f17 | 5c9c0020 | 02003f37 | 6e086af0 | 001c5ec0 | 0000001c | 02000887 | 6d3c58e0 | 02003ebf | 6c840018 | 6c344768 |
| 1366200 | 34a00024 | 364035c8 | 31f0247c | 000d0090 | 002834e0 | 00183f68 | 00243894 | 0020382c | 001c3aa0 | 000cc5cc | 0018386c | 3d302340 |
| 1366260 | 000d4c88 | 0000003c | 000d2094 | b27cb66c | 0000039f | 7fffffff | 000d22a0 | 02000ce5 | 020031ed | 020031e5 | 00004257 | 00000007 |
| 1366340 | 02003ebd | 0000000c | 00000007 | 00002aff | 29540030 | 0002438a | 5d100000 | 03003287 | 4b8c0000 | 00004257 | 537055f0 | 671c5370 |
| 1366420 | 5d100000 | 02003ebf | 5fa05370 | 4960228c | 00000040 | 000d2234 | b27cb66c | 000003a0 | 7fffffff | 000d2364 | 02000ce5 | 020031ed |
| 1366500 | 020031e5 | 000040ff | 02003645 | 00002197 | 0000000c | 01003ff5 | 00002197 | 00002aff | 000d2788 | 00000938 | b27cb66c | 000003a1 |
| 1366560 | 000003bf | 000d278c | 02000ce5 | 05001b0d | 000040ff | 0000001b | 00002c07 | 0067eb23 | 0000028b | 00002aff | 27f0004c | 000d239c |
| 1366640 | 51100000 | 03003287 | 4b8c0000 | 000040ff | 60cc56f8 | 671c5370 | 581867b8 | 53705c30 | 01003ff7 | 4b8c0000 | 00002197 | 36a43724 |
| 1366720 | 0018362c | 320c41d4 | 00002197 | 239c0000 | 000cc5cc | 00000040 | 000d22a0 | b27cb66c | 000003a2 | 7fffffff | 000d23f0 | 02000ce5 |
| 1367000 | 020031ed | 020031e5 | 000040ff | 02003645 | 000034a7 | 0000000c | 01003ff5 | 000034a7 | 00002aff | 28c4004c | 000d2428 | 5d100000 |
| 1367060 | 03003287 | 4b8c0000 | 000040ff | 60cc56f8 | 671c5370 | 581867b8 | 53705c30 | 01003ff7 | 4b8c0000 | 000034a7 | 36a43724 | 0018362c |
| 1367140 | 320c41d4 | 000034a7 | 239c0000 | 000cc5cc | 00000040 | 000d2364 | b27cb66c | 000003a3 | 7fffffff | 000d247c | 02000ce5 | 020031ed |
| 1367220 | 020031e5 | 000040ff | 02003645 | 00003467 | 0000000c | 01003ff5 | 00003467 | 00002aff | 28c4004c | 000d24b4 | 51100000 | 03003287 |
| 1367300 | 4b8c0000 | 000040ff | 60cc56f8 | 671c5370 | 581867b8 | 53705c30 | 01003ff7 | 4b8c0000 | 00003467 | 36a43724 | 0018362c | 320c41d4 |
| 1367360 | 00003467 | 239c0000 | 000cc5cc | 00000040 | 000d23f0 | b27cb66c | 000003a4 | 7fffffff | 000d2508 | 02000ce5 | 020031ed | 020031e5 |
| 1367440 | 000040ff | 02003645 | 000033ef | 0000000c | 01003ff5 | 000033ef | 00002aff | 28c4004c | 000d2540 | 5d100000 | 03003287 | 4b8c0000 |
| 1367520 | 000040ff | 60cc56f8 | 671c5370 | 581867b8 | 53705c30 | 01003ff7 | 4b8c0000 | 000033ef | 36a43724 | 0018362c | 320c41d4 | 000033ef |
| 1367600 | 239c0000 | 000cc5cc | 00000040 | 000d247c | b27cb66c | 000003a5 | 7fffffff | 000d25d0 | 02000ce5 | 020031ed | 020031e5 | 000040ff |
| 1367660 | 02003645 | 0000346f | 0000000c | 01003ff5 | 0000346f | 00002aff | 28c4004c | 000d2640 | 5d100000 | 03003287 | 4b8c0000 | 000040ff |
| 1367740 | 60cc56f8 | 671c5370 | 581867b9 | 53705c30 | 01003ff7 | 4b8c0000 | 0000346f | 36a43724 | 0018362c | 320c41d4 | 0000346f | 239c0000 |
| 1370020 | 000cc5cc | 00392e20 | 54686520 | 76616c69 | 64206d6f | 64657320 | 61726520 | 696e2c20 | 6f75742c | 20696e6f | 75742c20 | 62756666 |
| 1370100 | 65722061 | 6e64206c | 696e6b61 | 67652e00 | 00000078 | 000d2508 | b27cb66c | 000003a6 | 7fffffff | 000d26fc | 02000ce5 | 020031ed |
| 1370160 | 020031e5 | 000040ff | 02003645 | 0000000c | 00000010 | 020031f5 | 01003ff5 | 0000000e | 02000a3d | 01002ced | 0000000e | 02000a3d |
| 1370240 | 01002ced | 0000425f | 02000a31 | 01002ced | 00000012 | 02000a31 | 01002ced | 00004267 | 00002527 | 00002aff | 295400b4 | 0002438a |
| 1370320 | 5d100000 | 03003287 | 4b8c0000 | 000040ff | 64205818 | 67ec0020 | 537056f8 | 671c5370 | 5d100000 | 020031f7 | 60cc5aec | 01003ff7 |
| 1370400 | 671c5c30 | 02000a3f | 66700018 | 5c9c0018 | 01002cef | 6b745c30 | 02000a3f | 66700018 | 5c9c0018 | 01002cef | 4b9c0000 | 0000425f |
| 1370460 | 5e540000 | 02000a3f | 66700018 | 5c9c0018 | 01002cef | 67ec001c | 5e540000 | 02000a3f | 67b84af8 | 00002527 | 5e540000 | 01002cef |
| 1370540 | 4b8c0000 | 00004267 | 36a43724 | 00183678 | 00203614 | 001c22bc | 000cc5cc | 00000090 | 000d25d0 | b27cb56c | 000003a7 | 7fffffff |
| 1370620 | 000cdbdc | 02000ce5 | 020031ed | 020031e5 | 0000422f | 02000a31 | 02003645 | 000020af | 0000000c | 02000a3d | 0000083f | 02000a3d |
| 1370700 | 010036d5 | 00000010 | 02000a31 | 02000885 | 0000426f | 00000014 | 02000a3d | 010036dd | 00000018 | 0100371d | 0000001a | 020031f5 |
| 1370760 | 01003ebd | 0000001c | 02000885 | 00000016 | 01003ebd | 0000001e | 00002aff | 000d2bb0 | 0000006c | b27cb66c | 000003a8 | 000003c0 |
| 1371040 | 000cdc54 | 02000ce5 | 05001b01 | 0000422f | 0000001b | 00002c07 | 006a5cc3 | 0000028b | 00002aff | 000d2bb0 | 00000034 | 00000000 |
| 1371120 | 00000000 | 00000000 | 00000000 | 00000000 | 00000000 | 00000000 | 00000000 | 00000000 | 00000000 | 00000000 | ffffffff | 030041a7 |
| 1371200 | 00002c07 | 0000000c | 000d2890 | 000d2890 | 00010050 | 00000000 | 000c8d38 | 03003b77 | 00002c07 | 0000000c | 000d28f4 | 000d28f4 |
| 1371260 | 00010050 | 00000000 | 0007f6dc | 030041af | 00002c07 | 0000000c | 000d2918 | 000d2919 | 00010050 | 00000000 | 000a1910 | 000041b7 |
| 1371340 | 00002c07 | 00000000 | 000f1e34 | 000f1e34 | 0001005e | 00000000 | ffffffff | 000041bf | 00002c07 | 00000000 | 000f1ef4 | 000f1ef4 |
| 1371420 | 0001005e | 00000000 | 2cac0000 | 0002438a | 2ca00000 | 00000000 | 00000001 | 000ccd60 | 000ccd60 | 0002438a | 000d0634 | 0007f6fc |
| 1371500 | 030041c7 | 00002c07 | 0000000c | 000d2980 | 000d2980 | 00010050 | 00000000 | ffffffff | 030041cf | 00002c07 | 0000000c | 000d2a38 |
| 1371560 | 000d2a38 | 00010050 | 00000000 | 2cac0000 | 0002438a | 2ca00000 | 00000000 | 00000001 | 000ccfe4 | 000ccfe4 | 0002438a | 000d0630 |
| 1371640 | 2cac0000 | 0002438a | 2ca00000 | 00000000 | 00000001 | 000cd1dc | 000cd28c | 0002438a | 000d293c | 000cfdd0 | ffffffff | 030041d7 |
| 1371720 | 00002c07 | 0000000c | 000d29c8 | 000d29c8 | 00010050 | 00000000 | 0007f73c | 030041df | 00002c07 | 0000000c | 000d29f0 | 000d29f0 |
| 1372000 | 00010050 | 00000000 | 2cac0000 | 0002438a | 2ca00000 | 00000000 | 00000001 | 000cd35c | 000cd40c | 0002438a | 000d29a4 | 000cfc24 |
| 1372060 | 000a46a0 | 03004217 | 00002c07 | 0000000c | 000d4b64 | 000d4b64 | 00010051 | 00000000 | 2cac0000 | 0002438a | 2ca00000 | 00000000 |
| 1372140 | 00000001 | 000cd4bc | 000cd4bc | 0002438a | 000d29ec | 000cd4c8 | 2cac0000 | 0002438a | 2ca00000 | 00000000 | 00000001 | 000cd53c |
| 1372220 | 000cd65c | 0002438a | 000d2a14 | 000cf9fc | 000d04b8 | 030041e7 | 00002c07 | 0000000c | 000d2aa0 | 000d2aa0 | 00010050 | 00000000 |
| 1372300 | 2cac0000 | 0002438a | 2ca00000 | 00000000 | 00000001 | 000cd70c | 000cd7a4 | 0002438a | 000d2a5c | 000cf8dc | 000cc57c | 030041ef |
| 1372360 | 00002c07 | 0000000c | 000d2ac8 | 000d2ac8 | 00010050 | 00000000 | ffffffff | 030041f7 | 00002c07 | 0000000c | 000d4b20 | 000d4b20 |
| 1372440 | 00010051 | 00000000 | 2cac0000 | 0002438a | 2ca00000 | 00000000 | 00000001 | 000cd874 | 000cd90c | 0002438a | 000d2ac4 | 000cf708 |

| | | | | | | | | | | | | |
|---|---|---|---|---|---|---|---|---|---|---|---|---|
| 1372520 | 2cac0000 | 0002438a | 2ca00000 | 00000000 | 00000001 | 000cda1c | 000cdab4 | 0002438a | 000d2aec | 000cf530 | 000d012c | 000d0a90 |
| 1372600 | 00272f68 | 6f6d652f | 6f736173 | 312f612f | 73726565 | 2f73656d | 616e7469 | 635f6368 | 65636b31 | 2f657870 | 72002aff | 002a2f68 |
| 1372660 | 6f6d652f | 6f736173 | 312f612f | 73726565 | 2f73656d | 616e7469 | 635f6368 | 65636b31 | 2f657870 | 722e706c | 0074795f | 0000002c |
| 1372740 | 0009cd90 | b27cb66c | 000003c6 | 7fffffff | 000d0884 | 02000ce5 | 02002934 | 0000428f | 00000293 | 00002aff | 0000002c | 0009dc84 |
| 1373020 | b27cb66c | 000003ed | 7fffffff | 000d08b0 | 02000ce5 | 02001f6d | 0000428f | 00002c07 | 00002aff | 000d2428 | 00000034 | 000d77c8 |
| 1373100 | 7fffffff | 00000000 | 000d2bf9 | 0000002c | b27cb66c | 000003c8 | 000003ec | 0009cbc1 | 02000ce5 | 02002385 | 0000428f | 00002c07 |
| 1373160 | 00002aff | 000d2c28 | 00000038 | b27cb66c | 000003c9 | 000003ee | 000d2d2c | 02000ce5 | 05001b0d | 0000246f | 0000000b | 00002c07 |
| 1373240 | 006b96a3 | 00000293 | 00002aff | 000d2428 | 0000002c | b4f0b4e4 | 000003c8 | 7fffffff | 0007eaad | 00000000 | 00000000 | 000d42c0 |
| 1373320 | 0002438a | 000d77d4 | 2c780038 | 0002438a | 35c82520 | 437c329c | 24d00000 | 000d72f4 | 001443e4 | 01003ff7 | 69b04078 | 000b0b9c |
| 1373400 | 001039a4 | 00080d0c | 000c234c | 0007fd0c | 0000009c | 000ce408 | b27cb66c | 000003ca | 7fffffff | 000d2e20 | 02000ce5 | 020031ed |
| 1373460 | 020031e5 | 00003b3f | 02000a3d | 02000885 | 00003b1f | 0000000c | 02000885 | 00004297 | 00000010 | 020031f5 | 02003ff5 | 00000014 |
| 1373540 | 00000018 | 02000a3d | 02000895 | 0000000e | 02003ff5 | 00000016 | 0000001c | 02000a3d | 02000885 | 00000012 | 02003ff5 | 00000016 |
| 1373620 | 00000020 | 04003b15 | 00000016 | 0000001e | 00000022 | 0000001a | 00002aff | 000d2e98 | 00000038 | b27cb66c | 000003cb | 000003ef |
| 1373700 | 000d2e9c | 02000ce5 | 05001b01 | 00003b3f | 0000001b | 00002c07 | 006b97a3 | 00000293 | 00002aff | 2c7800bc | 0002438a | 5d100000 |
| 1373760 | 03003287 | 4b8c0000 | 00003b3f | 60cc56f8 | 671c55f0 | 682c5370 | 581867b8 | 53705c30 | 020031f7 | 65300018 | 5e540000 | 02003ff7 |
| 1374040 | 66700020 | 5c9c0018 | 02000a3f | 66c0001c | 00185ec0 | 0000001c | 02000897 | 6b7458e0 | 02003ff7 | 6c840020 | 67ec001c | 5c9c0018 |
| 1374120 | 02000a3f | 66c00018 | 00245ec0 | 00000018 | 02000887 | 6d3c58e0 | 02003ff7 | 6c840020 | 67ec0018 | 5c9c0024 | 04003b17 | 6c840020 |
| 1374200 | 6c84001c | 6c840018 | 6c344768 | 33bc247c | 000d7314 | 0018386c | 34302340 | 000d7334 | 0000007c | 000d2c90 | b27cb66c | 000003cc |
| 1374260 | 7fffffff | 000d2f60 | 02000ce5 | 020031ed | 020031e5 | 00004297 | 02000a34 | 03003375 | 0000336f | 0000000c | 00000010 | 02000a3d |
| 1374340 | 0000083f | 02000885 | 0000429f | 00000014 | 020031f5 | 02003ff5 | 00000018 | 0100336d | 0000001c | 02000885 | 00000016 | 02003ff5 |
| 1374420 | 0000001a | 0000001e | 00002aff | 000d3490 | 00000038 | b27cb66c | 000003cd | 000003f0 | 000d3494 | 02000ce5 | 05001b0d | 00004297 |
| 1374500 | 0000001b | 00002c07 | 006b99a3 | 00000293 | 00002aff | 27f0008c | 000d2fd4 | 5d100000 | 03003287 | 4b8c0000 | 00004297 | 64205818 |
| 1374560 | 67b855f0 | 682c5370 | 56f8671c | 53705aec | 020031f7 | 6110001c | 5d100000 | 02003ff7 | 67ec0018 | 5a190000 | 0100336f | 671c5ec0 |
| 1374640 | 0000001c | 02000897 | 6d3c58e0 | 02003ff7 | 6c840018 | 6b74370c | 00184768 | 34e0001c | 3228320c | 43000000 | 0000336f | 000d7378 |
| 1374720 | 00182ecc | 386c3d30 | 24200000 | 000d7398 | 0000007c | 000d2e20 | b27cb66c | 000003ce | 7fffffff | 000d1068 | 02000ce5 | 020031ed |
| 1375000 | 020031e5 | 00004297 | 02000a3d | 03003375 | 0000337f | 0000000c | 00000010 | 02000a3d | 0000083f | 02000885 | 000042a7 | 00000014 |
| 1375060 | 020031f5 | 02003ff5 | 00000018 | 0100337d | 0000001c | 02000895 | 00000016 | 02003ff5 | 0000001a | 0000001e | 00002aff | 28c4008c |
| 1375140 | 000d30dc | 5d100000 | 03003287 | 4b8c0000 | 00004297 | 64205818 | 67b855f0 | 682c5370 | 56f8671c | 53705aec | 020031f7 | 6110001c |
| 1375220 | 5d100000 | 02003ff7 | 67ec0018 | 5a180000 | 0100337f | 671c5ec0 | 0000001c | 02000887 | 6d3c58e0 | 02003ff7 | 6c840018 | 6b74370c |
| 1375300 | 00184768 | 34e0001c | 3228320c | 43000000 | 0000337f | 000d7378 | 00182ecc | 386c3d30 | 24200000 | 000d73dc | 0000007c | 000d2f60 |
| 1375360 | b27cb66c | 000003cf | 7fffffff | 000d3170 | 02000ce5 | 020031ed | 020031e5 | 00004297 | 02000a3d | 03003375 | 000033a7 | 0000000c |
| 1375440 | 00000010 | 02000a31 | 0000083f | 02000885 | 000042af | 00000014 | 020031f5 | 02003ff5 | 00000018 | 010033a5 | 0000001c | 02000885 |
| 1375520 | 00000016 | 02003ff5 | 0000001a | 0000001e | 00002aff | 28c4008c | 000d31e4 | 5d100000 | 03003287 | 4b8c0000 | 00004297 | 64205818 |
| 1375600 | 67b855f0 | 682c5370 | 56f8671c | 53705aec | 020031f7 | 6110001c | 5d100000 | 02003ff7 | 67ec0018 | 5a180000 | 010033a7 | 671c5ec0 |
| 1375660 | 0000001c | 02000887 | 6d3c58e0 | 02003ff7 | 6c840018 | 6b74370c | 00184768 | 34e0001c | 3228320c | 43000000 | 000033a7 | 000d7378 |
| 1375740 | 00182ecc | 386c3d30 | 24200000 | 000d73fc | 0000007c | 000d3068 | b27cb66c | 000003d0 | 7fffffff | 000d3278 | 02000ce5 | 020031ed |
| 1376020 | 020031e5 | 00004297 | 02000a3d | 03003375 | 0000338f | 0000000c | 00000010 | 02000a3d | 0000083f | 02000885 | 00003b1f | 00000014 |
| 1376100 | 020031f5 | 02003ff5 | 00000018 | 0100338d | 0000001c | 02000885 | 00000016 | 02003ff5 | 0000001a | 0000001e | 00002aff | 28c4008c |
| 1376160 | 000d32ec | 5d100000 | 03003287 | 4b8c0000 | 00004297 | 64205818 | 67b855f0 | 682c5370 | 56f8671c | 53705aec | 020031f7 | 6110001c |
| 1376240 | 5d100000 | 02003ff7 | 67ec0019 | 5a180000 | 0100338f | 671c5ec0 | 0000001c | 02000887 | 6d3c58e0 | 02003ff7 | 6c840018 | 6b74370c |
| 1376320 | 00184768 | 34e0001c | 3228320c | 43000000 | 0000338f | 000d7378 | 00182ecc | 386c3d30 | 24200000 | 000d7314 | 0000007c | 000d3170 |
| 1376400 | b27cb66c | 000003d1 | 7fffffff | 000d3380 | 02000ce5 | 020031ed | 020031e5 | 00004297 | 02000a3d | 03003375 | 00003397 | 0000000c |
| 1376460 | 00000010 | 02000a31 | 0000083f | 02000885 | 00003b1f | 00000014 | 020031f5 | 02003ff5 | 00000018 | 01003395 | 0000001c | 02000885 |
| 1376540 | 00000016 | 02003ff5 | 0000001a | 0000001e | 00002aff | 28c4008c | 000d33b4 | 5d100000 | 03003287 | 4b8c0000 | 00004297 | 64205818 |
| 1376620 | 67b855f0 | 682c5370 | 56f8671c | 53705aec | 020031f7 | 6110001c | 5d100000 | 02003ff7 | 67ec0018 | 5a180000 | 01003397 | 671c5ec0 |
| 1376700 | 0000001c | 02000887 | 6d3c58e0 | 02003ff7 | 6c840018 | 6b74370c | 00184768 | 34e0001c | 3228320c | 43000000 | 00003397 | 000d7378 |
| 1376760 | 00182ecc | 386c3d30 | 24200000 | 000d7314 | 0000003c | 000d3278 | b27cb66c | 000003d2 | 7fffffff | 000d33ec | 02000ce5 | 020031ed |
| 1377040 | 020031e5 | 00004297 | 00000007 | 02003ff5 | 0000000c | 00000007 | 00002aff | 29540030 | 0002438a | 5d100000 | 03003287 | 4b8c0000 |
| 1377120 | 00004297 | 537055f0 | 671c5370 | 5d100000 | 02003ff7 | 5fa05370 | 4960228c | 000000a8 | 000d3380 | b27cb66c | 000003d3 | 7fffffff |
| 1377200 | 000d3594 | 02000ce5 | 020031ed | 020031e5 | 0000429f | 02000a3d | 02000885 | 00003b1f | 0000000c | 02000a3d | 03003375 | 0000336f |
| 1377260 | 00000010 | 00000014 | 02000a3d | 0000083f | 02000885 | 0000429f | 00000018 | 020031f5 | 02003ff5 | 0000001c | 0200336d | 00000020 |
| 1377340 | 00000024 | 02000a3d | 02000885 | 0000000e | 02003ff5 | 0000001e | 00000022 | 02000885 | 0000001a | 02003ff5 | 0000001e | 00000026 |
| 1377420 | 00002aff | 000d36ec | 00000038 | b27cb66c | 000003d4 | 000003f1 | 000d36f0 | 02000ce5 | 05001b0d | 0000429f | 0000001b | 00002c07 |
| 1377500 | 006b9cc3 | 00000293 | 00002aff | 27f000c8 | 000d35e8 | 5d100000 | 03003287 | 4b8c0000 | 0000429f | 60cc56f8 | 671c55f0 | 686855f0 |
| 1377560 | 69b05370 | 581867b8 | 53705c30 | 020031f7 | 6530001c | 5e540000 | 02003ff7 | 67ec0018 | 5a180000 | 0200336f | 66700020 | 5c9c001c |

| | | | | | | | | | | | | |
|---|---|---|---|---|---|---|---|---|---|---|---|---|
| 1377640 | 02000a3f | 66c00024 | 001c5ec0 | 00000024 | 02000887 | 6b7458e0 | 02003ff7 | 6c840018 | 6c840020 | 5c9c001c | 02000887 | 6d3c58e0 |
| 1377720 | 02003ff7 | 6c840018 | 6c344768 | 3410001c | 24d00000 | 000d7314 | 002034e0 | 001c3fe4 | 0018001c | 38e83228 | 320c42ac | 0000336f |
| 1400000 | 000d7378 | 00182ecc | 386c3d30 | 24200000 | 000d7398 | 0000005c | 000d33ec | b27cb66c | 000003d5 | 7fffffff | 000d3648 | 02000ce5 |
| 1400060 | 020031ed | 020031e5 | 0000429f | 02000885 | 00003b1f | 0000000c | 020031f5 | 02003ff5 | 00000010 | 00000014 | 02000885 | 0000000e |
| 1400140 | 02003ff5 | 00000012 | 00000016 | 00002aff | 29540058 | 0002438a | 5d100000 | 03003287 | 4b8c0000 | 0000429f | 60cc56f8 | 671c5370 |
| 1400220 | 581867b8 | 53705c30 | 020031f7 | 6530001c | 5e540000 | 02003ff7 | 66700018 | 5c9c001c | 02000887 | 6b7458e0 | 02003ff7 | 6c840018 |
| 1400300 | 6c3422bc | 000d7314 | 000000a8 | 000d3594 | b27cb66c | 000003d6 | 7fffffff | 000d37f0 | 02000ce5 | 020031ed | 020031e5 | 000042a7 |
| 1400360 | 02000a3d | 02000885 | 00003b1f | 0000000c | 02000a3d | 03003375 | 0000337f | 00000010 | 00000014 | 02000a3d | 0000083f | 02000885 |
| 1400440 | 000042a7 | 00000018 | 020031f5 | 02003ff5 | 0000001c | 0200337d | 00000020 | 00000024 | 02000a3d | 02000885 | 0000000e | 02003ff5 |
| 1400520 | 0000001e | 00000022 | 02000885 | 0000001a | 02003ff5 | 0000001e | 00000026 | 00002aff | 000d3948 | 00000038 | b27cb66c | 000003d7 |
| 1400600 | 000003f2 | 000d394c | 02000ce5 | 05001b0d | 000042a7 | 0000001b | 00002c07 | 006b9ee3 | 00000293 | 00002aff | 27f000c8 | 000d3844 |
| 1400660 | 5d100000 | 03003287 | 4b8c0000 | 000042a7 | 60cc56f8 | 671c55f0 | 686855f0 | 69b05370 | 581867b8 | 53705c30 | 020031f7 | 6530001c |
| 1400740 | 5e540000 | 02003ff7 | 67ec0018 | 5a180000 | 0200337f | 66700020 | 5c9c001c | 02000a3f | 66c00024 | 001c5ec0 | 00000024 | 02000887 |
| 1401020 | 6b7458e0 | 02003ff7 | 6c840018 | 6c840020 | 5c9c001c | 02000887 | 6d3c58e0 | 02003ff7 | 6c840018 | 6c344768 | 3410001c | 24d00000 |
| 1401100 | 000d7314 | 002034e0 | 001c3fe4 | 0018001c | 38e83228 | 320c42ac | 0000337f | 000d7378 | 00182ecc | 386c3d30 | 24200000 | 000d73dc |
| 1401160 | 0000005c | 000d3648 | b27cb66c | 000003d8 | 7fffffff | 000d38a4 | 02000ce5 | 020031ed | 020031e5 | 000042a7 | 02000885 | 00003b1f |
| 1401240 | 0000000c | 020031f5 | 02003ff5 | 00000010 | 00000014 | 02000885 | 0000000e | 02003ff5 | 00000012 | 00000016 | 00002aff | 29540058 |
| 1401320 | 0002438a | 5d100000 | 03003287 | 4b8c0000 | 000042a7 | 60cc56f8 | 671c5370 | 581867b8 | 53705c30 | 020031f7 | 6530001c | 5e540000 |
| 1401400 | 02003ff7 | 66700018 | 5c9c001c | 02000887 | 6b7458e0 | 02003ff7 | 6c840018 | 6c3422bc | 000d7314 | 000000a8 | 000d37f0 | b27cb66c |
| 1401460 | 000003d9 | 7fffffff | 000d3a4c | 02000ce5 | 020031ed | 020031e5 | 000042af | 02000a3d | 02000885 | 00003b1f | 0000000c | 02000a3d |
| 1401540 | 03003375 | 000033a7 | 00000010 | 00000014 | 02000a3d | 0000083f | 02000885 | 000042af | 00000018 | 020031f5 | 02003ff5 | 0000001c |
| 1401620 | 020033a5 | 00000020 | 00000024 | 02000a3d | 02000885 | 0000000e | 02003ff5 | 0000001e | 00000022 | 02000885 | 0000001a | 02003ff5 |
| 1401700 | 0000001e | 00000026 | 00002aff | 000d3b88 | 00000038 | b27cb66c | 000003da | 000003f3 | 000d3b8c | 02000ce5 | 05001b0d | 000042af |
| 1401760 | 0000001b | 00002c07 | 006b9fe3 | 00000293 | 00002aff | 27f000c8 | 000d3aa0 | 5d100000 | 03003287 | 4b8c0000 | 000042af | 60cc56f8 |
| 1402040 | 671c55f0 | 686855f0 | 69b05370 | 581867b8 | 53705c30 | 020031f7 | 6530001c | 5e540000 | 02003ff7 | 67ec0018 | 5a180000 | 020033a7 |
| 1402120 | 66700020 | 5c9c001c | 02000a3f | 66c00024 | 001c5ec0 | 00000024 | 02000887 | 6b7458e0 | 02003ff7 | 6c840018 | 6c840020 | 5c9c001c |
| 1402200 | 02000887 | 6d3c58e0 | 02003ff7 | 6c840018 | 6c344768 | 3410001c | 24d00000 | 000d7314 | 002034e0 | 001c3fe4 | 0018001c | 38e83228 |
| 1402260 | 320c42ac | 000033a7 | 000d7378 | 00182ecc | 386c3d30 | 24200000 | 000d73fc | 0000005c | 000d38a4 | b27cb66c | 000003db | 7fffffff |
| 1402340 | 000d3b00 | 02000ce5 | 020031ed | 020031e5 | 000042af | 02000885 | 00003b1f | 0000000c | 020031f5 | 02003ff5 | 00000010 | 00000014 |
| 1402420 | 02000885 | 0000000e | 02003ff5 | 00000012 | 00000016 | 00002aff | 29540058 | 0002438a | 5d100000 | 03003287 | 4b8c0000 | 000042af |
| 1402500 | 60cc56f8 | 671c5370 | 581867b8 | 53705c30 | 020031f7 | 6530001c | 5e540000 | 02003ff7 | 66700018 | 5c9c001c | 02000887 | 6b7458e0 |
| 1402560 | 02003ff7 | 6c840018 | 6c3422bc | 000d7314 | 0000008c | 000d3a4c | b27cb66c | 000003dc | 7fffffff | 000d3c64 | 02000ce5 | 020031ed |
| 1402640 | 020031e5 | 00003b1f | 02000a3d | 02000885 | 00003b27 | 0000000c | 02000885 | 00003b37 | 00000010 | 020031f5 | 02003ff5 | 00000014 |
| 1402720 | 02003b1d | 00000018 | 0000001c | 02000a3d | 02000885 | 0000000e | 02003ff5 | 00000016 | 0000001a | 02000885 | 00000012 | 02003ff5 |
| 1403000 | 00000016 | 0000001e | 00002aff | 000d3cf0 | 00000038 | b27cb66c | 000003dd | 000003f4 | 000d3cf4 | 02000ce5 | 05001b0d | 00003b1f |
| 1403060 | 0000001b | 00002c07 | 006b98a3 | 00000293 | 00002aff | 2c7800a0 | 0002438a | 5d100000 | 03003287 | 4b8c0000 | 00003b1f | 60cc56f8 |
| 1403140 | 671c55f0 | 682c5370 | 581867b8 | 53705c30 | 020031f7 | 6530001c | 5e540000 | 02003ff7 | 67ec0018 | 5a180000 | 02003b1f | 66700020 |
| 1403220 | 5c9c001c | 02000a3f | 66c00024 | 001c5ec0 | 00000024 | 02000887 | 6b7458e0 | 02003ff7 | 6c840018 | 6c840020 | 5c9c001c | 02000887 |
| 1403300 | 6d3c58e0 | 02003ff7 | 6c840018 | 6c344768 | 33bc247c | 000d7538 | 0018386c | 3d302340 | 000d7558 | 00000090 | 000d3b00 | b27cb66c |
| 1403360 | 000003de | 7fffffff | 000d3dcc | 02000ce5 | 020031ed | 020031e5 | 00003b37 | 02000a3d | 02000885 | 00003697 | 0000000c | 02000a3d |
| 1403440 | 0000083f | 02000885 | 00003b27 | 00000010 | 020031f5 | 02003ff5 | 00000014 | 02003b35 | 00000018 | 0000001c | 02000a3d | 02000885 |
| 1403520 | 0000000e | 01003ff5 | 0000001a | 02000885 | 00000012 | 02003ff5 | 00000016 | 0000001e | 00002aff | 000d3e78 | 00000038 | b27cb66c |
| 1403600 | 000003df | 000003f5 | 000d3e7c | 02000ce5 | 05001b0d | 00003b37 | 0000001b | 00002c07 | 006baac3 | 00000293 | 00002aff | 27f000a0 |
| 1403660 | 000d3e00 | 5d100000 | 03003287 | 4b8c0000 | 00003b37 | 60cc56f8 | 671c55f0 | 682c5370 | 581867b8 | 53705c30 | 020031f7 | 6530001c |
| 1403740 | 5e540000 | 02003ff7 | 67ec0018 | 5a180000 | 02003b37 | 66700020 | 5c9c001c | 02000a3f | 66c00024 | 001c5ec0 | 00000024 | 02000887 |
| 1404020 | 6b7458e0 | 01003ff7 | 6c840020 | 5c9c001c | 02000887 | 6d3c58e0 | 02003ff7 | 6c840018 | 6c344768 | 33bc247c | 000d75ac | 00182ecc |
| 1404100 | 386c3d30 | 24200000 | 000d7539 | 0000003c | 000d3c64 | b27cb66c | 000003e0 | 7fffffff | 000d3e38 | 02000ce5 | 020031ed | 020031e5 |
| 1404160 | 00003b37 | 00000007 | 02003ff5 | 0000000c | 00000007 | 00002aff | 29540030 | 0002438a | 5d100000 | 03003287 | 4b8c0000 | 00003b37 |
| 1404240 | 537055f0 | 671c5370 | 5d100000 | 02003ff7 | 5fa05370 | 4960228c | 00000044 | 000d3dcc | b27cb66c | 000003e1 | 7fffffff | 000d3f44 |
| 1404320 | 02000ce5 | 020031ed | 020031e5 | 00003697 | 03003695 | 0000369f | 0000000c | 00000010 | 01003ff5 | 0000369f | 00002aff | 000d42bc |
| 1404400 | 00000078 | b27cb66c | 000003e2 | 000003f6 | 000d42c0 | 02000ce5 | 05001b0d | 00003697 | 0000001b | 00002c07 | 006bad63 | 00000293 |
| 1404460 | 00002aff | 000d42bc | 00000040 | 000cfe99 | 000cf971 | 000c8928 | 000c87f0 | 000cfea1 | 00000000 | 00000000 | 00000000 | 00000000 |
| 1404540 | 00000000 | 00000000 | 00000000 | 00000000 | 00000000 | 27f00050 | 000d3f80 | 5d100000 | 03003287 | 4b8c0000 | 00003697 | 64205818 |
| 1404620 | 67b85370 | 56f8671c | 53705aec | 01003ff7 | 4b8c0000 | 0000369f | 370c0018 | 3724001c | 3228320c | 42400000 | 0000369f | 239c0000 |
| 1404700 | 000d7480 | 00000044 | 000d3e38 | b27cb66c | 000003e3 | 7fffffff | 000d3fd8 | 02000ce5 | 020031ed | 020031e5 | 00003697 | 03003695 |

```
1404760 000036a7 0000000c 00000010 01003ff5 000036a7 00002aff 28c40050 000d4014 5d100000 03003287 4b8c0000 00003697
1405040 64205818 67b85370 56f8671c 53705aec 01003ff7 4b8c0000 000036a7 370c0018 3724001c 3228320c 42400000 000036a7
1405120 239c0000 000d7480 00000044 000d3f44 b27cb66c 000003e4 7fffffff 000d406c 02000ce5 020031ed 020031e5 00003697
1405200 03003695 000036af 0000000c 00000010 01003ff5 000036af 00002aff 28c40050 000d40a8 5d100000 03003287 4b8c0000
1405260 00003697 64205818 67b85370 56f8671c 53705aec 01003ff7 4b8c0000 000036af 370c0018 3724001c 3228320c 42400000
1405340 000036af 239c0000 000d7480 00000044 000d3fd8 b27cb66c 000003e5 7fffffff 000d4100 02000ce5 020031ed 020031e5
1405420 00003697 03003695 00003727 0000000c 00000010 01003ff5 00003727 00002aff 28c40050 000d413c 5d100000 03003287
1405500 4b8c0000 00003697 64205818 67b85370 56f8671c 53705aec 01003ff7 4b8c0000 00003727 370c0018 3724001c 3228320c
1405560 42400000 00003727 239c0000 000d7480 00000044 000d406c b27cb66c 000003e6 7fffffff 000d4194 02000ce5 020031ed
1405640 020031e5 00003697 03003695 0000372f 0000000c 00000010 01003ff5 0000372f 00002aff 28c40050 000d41d0 5d100000
1405720 03003287 4b8c0000 00003697 64205818 67b85370 56f8671c 53705aec 01003ff7 4b8c0000 0000372f 370c0018 3724001c
1406000 3228320c 42400000 0000372f 239c0000 000d7480 00000044 000d4100 b27cb66c 000003e7 7fffffff 000d4228 02000ce5
1406060 020031ed 020031e5 00003697 03003695 00003737 0000000c 00000010 01003ff5 00003737 00002aff 29540050 0002438a
1406140 5d100000 03003287 4b8c0000 00003697 64205818 67b85370 56f8671c 53705aec 01003ff7 4b8c0000 00003737 370c0018
1406220 3724001c 3228320c 42400000 00003737 239c0000 000d7480 00000098 000d4194 b27cb66c 000003e8 7fffffff 000d43b0
1406300 02000ce5 020031ed 020031e5 000042b7 02000a3d 0100413d 0000000c 02000a3d 02000885 00003b3f 00000010 02000885
1406360 000042b7 00000014 020031f5 02003ff5 00000018 00000001 0000001c 00000020 02000a3d 02000885 00000012 02003ff5
1406440 0000001a 0000001e 02000885 00000016 02003ff5 0000001a 00000022 00002aff 000d4418 00000038 b130b66c 000003e9
1406520 000003f7 000d2c2d 02000ce5 05001b04 000042b7 0000001b 00002c07 006bb723 00000293 00002aff 27f000b8 000d43e4
1406600 51100000 03003287 4b8c0000 000042b7 60cc56f8 671c55f0 686855f0 69b05370 581867b8 53705c30 020031f7 6530001c
1406660 5e540000 02003ff7 67ec0018 55f06670 00205ec0 0000001c 02000a3f 66c00024 001c5ec0 00000024 02000887 6e0858e0
1406740 02003ff7 6c840018 6c840020 5c9c001c 02000887 6d3c58e0 02003ff7 6c840018 6c344768 34a0001c 364035c8 31f0247c
1407020 000d0090 002033bc 3e70001c 3c480000 000d72f4 0018386c 3d302340 000d76e4 0000003c 000d4228 b27cb66c 000003ea
1407100 7fffffff 0009dd8c 02000ce5 020031ed 020031e5 000042b7 00000007 02003ff5 0000000c 00000007 00002aff 29540030
1407160 0002438a 5d100000 03003287 4b8c0000 000042b7 537055f0 671c5370 5d100000 02003ff7 5fa05370 4960228c 000d52c0
1407240 000006ec 00000000 00000000 00000000 00000000 00000000 00000000 00000000 00000000 00000000 00000000 00000000
1407320 00000000 00000000 00000000 00000000 00000000 00000000 00000000 00000000 00000000 00000000 00000000 00000000
*
1412540 00000000 00000000 00000000 00000000 00000000 00000000 00000000 00000000 00000000 00000000 000a46f0 0300421f
1412620 00002c07 0000000c 000d4ba8 000d4ba8 00010051 00000000 2cac0000 0002438a 2ca00000 00000000 00000001 000d0a84
1412700 000d0a84 0002438a 000d2af4 000a4710 03004227 00002c07 0000000c 000d4db8 000d4db8 00010051 00000000 2cac0000
1412760 0002438a 2ca00000 00000000 00000001 000d0c78 000d0dac 0002438a 000d2af0 000a4730 0300422f 00002c07 0000000c
1413040 000d505c 000d505c 00010051 00000000 2cac0000 0002438a 2ca00000 00000000 00000001 000d0e4c 000d0ef4 0002438a
1413120 000d4bcc 000cf44c 00166d6f 72655f65 6e746974 795f6465 636c5f69 74656d73 00000000 ffffffff 03004237 00002c07
1413200 0000000c 000d4c98 000d4c98 00010051 00000000 ffffffff 0300423f 00002c07 0000000c 000d4c2c 000d4c2c 00010051
1413260 00000000 2cac0000 0002438a 2ca00000 00000000 00000001 000d1030 000d10f4 0002438a 000d4c50 000cf2ac b4640000
1413340 000d10c8 000d4c6c 2b240000 0002438a 000d1104 b4640000 000d1130 000d4cc0 000a67f0 03004257 00002c07 0000000c
1413420 000d4f14 000d4f14 00010051 00000000 2cac0000 0002438a 2ca00000 00000000 00000001 000d11b0 000d16f0 0002438a
1413500 000d4cbc 000cf4cc b4640000 000d1210 000d4cd8 2aa80000 000d4ce4 000d1268 b4640000 000d12b8 000d4cf0 2aa80000
1413560 000d4cfc 000d1310 b4640000 000d1360 000d4d08 2aa80000 000d4d14 000d13b8 b4640000 000d1408 000d4d20 2aa80000
1413640 000d4d2c 000d1460 b4640000 000d14b0 000d4d38 2aa80000 000d4d44 000d1508 b4640000 000d1558 000d4d50 2aa80000
1413720 000d4d5c 000d15b0 b4640000 000d1600 000d4d68 2aa80000 000d4d74 000d1658 b4640000 000d16a8 000d4d8c 2b240000
1414000 0002438a 000d1700 0009706f 72745f6c 69737400 b4640000 000d1750 000d4de0 ffffffff 03004247 00002c07 0000000c
1414060 000d4e2c 000d4e2c 00010051 00000000 2cac0000 0002438a 2ca00000 00000000 00000001 000d180c 000d180c 0002438a
1414140 000d4ddc 000d1818 b4640000 000d18ec 000d4e54 ffffffff 030034b7 00002c07 0000000c 000d4e60 000d4e60 00010051
1414220 00000000 ffffffff 0300424f 00002c07 0000000c 000d4e94 000d4e94 00010051 00000000 2cac0000 0002438a 2ca00000
1414300 00000000 00000001 000d1990 000d1990 0002438a 000d4e50 000d199c b4640000 000d1a28 000d4e88 2cac0000 0002438a
1414360 2ca00000 00000000 00000001 000d1b74 000d1b74 0002438a 000d4e84 000d1b80 b4640000 000d1d14 000d4ebc 2cac0000
1414440 0002438a 2ca00000 00000000 00000001 000d1e04 000d1ee4 0002438a 000d4eb8 000c8c50 b4640000 000d1eb8 000d4ed4
1414520 2b240000 0002438a 000d1ef4 b4640000 000d1f20 000d4f08 2cac0000 0002438a 2ca00000 00000000 00000001 000d1fd8
1414600 000d1fd8 0002438a 000d4f04 000d1fe4 b4640000 000d2098 000d4f3c 2cac0000 0002438a 2ca00000 00000000 00000001
1414660 000d215c 000d2268 0002438a 000d4f38 000c9ef8 b4640000 000d2238 000d4f54 2b240000 0002438a 000d2278 b4640000
1414740 000d22a4 000d4f88 2cac0000 0002438a 2ca00000 00000000 00000001 000d2310 000d2640 0002438a 000d4f84 000c9874
1415020 b4640000 000d2368 000d4fa0 2aa80000 000d4fac 000d23ac b4640000 000d23f4 000d4fb8 2aa80000 000d4fc4 000d2438
1415100 b4640000 000d2480 000d4fd0 2aa80000 000d4fdc 000d24c4 b4640000 000d250c 000d5008 2aa80000 000d5014 000d2550
```

| | | | | | | | | | | | | |
|---|---|---|---|---|---|---|---|---|---|---|---|---|
| 1415160 | 001d3a20 | 69732061 | 6e20696e | 76616c69 | 64206d6f | 6465206f | 6e206c69 | 6e652000 | b4640000 | 000125d4 | 000d5020 | 2b240000 |
| 1415240 | 0002438a | 000d2650 | b4640000 | 000d2700 | 000d5090 | 000042d7 | b3280010 | 0009dc88 | 00000000 | 0007f77c | 0300426f | 00002c07 |
| 1415320 | 0000000c | 000d50ec | 000150ec | 00010051 | 00000000 | 2cac0000 | 0002438a | 2ca00000 | 00000000 | 00000001 | 000cdb00 | 000cdb00 |
| 1415400 | 0002438a | 000d5080 | 000cdb0c | 00086765 | 6e657269 | 63730000 | b4640000 | 000cdbe0 | 000d5114 | 000042d7 | b3280010 | 0009cd94 |
| 1415460 | 00000000 | 000cf8fc | 030020af | 00002c07 | 0000000c | 000d5130 | 000d5130 | 00010051 | 00000000 | ffffffff | 03004277 | 00002c07 |
| 1415540 | 0000000c | 000d519c | 000d519c | 00010051 | 00000000 | 2cac0000 | 0002438a | 2ca00000 | 00000000 | 00000001 | 000cdc84 | 000cdc84 |
| 1415620 | 0002438a | 000d5110 | 000cdc90 | b4640000 | 000cdd1c | 000d5158 | 0000428f | b3280000 | 000d2b8c | 00000000 | 2cac0000 | 0002438a |
| 1415700 | 2ca00000 | 00000000 | 00000001 | 000cde68 | 000ce120 | 0002438a | 000d5154 | 000d5170 | b4640000 | 000ce01c | 000d5180 | 2b240000 |
| 1415760 | 0002438a | 000ce130 | 03003287 | 29c80000 | 000d5164 | 000cde78 | b4640000 | 000ce2a8 | 000d51c4 | 0000428f | b3280000 | 000d2b60 |
| 1416040 | 00000000 | 2cac0000 | 0002438a | 2ca00000 | 00000000 | 00000001 | 000ce358 | 000ce438 | 0002438a | 000d51c0 | 000d51dc | b4640000 |
| 1416120 | 000ce40c | 000d52a4 | 2b240000 | 0002438a | 000ce448 | 03003287 | 29c80000 | 000d51d0 | 000ce368 | b4640000 | 000d3384 | 000d7418 |
| 1416200 | 2aa851f0 | 000d740c | 000d32fc | 000e6d6f | 72655f70 | 72696d61 | 72696573 | 000d061c | 000d2d68 | 000c8bc4 | b46451fc | 000d327c |
| 1416260 | 000d51ec | 2aa85224 | 000d51f8 | 000d31f4 | b4645230 | 000d3174 | 000d5220 | 2aa8523c | 000d522c | 000d30ec | b4645248 | 000d306c |
| 1416340 | 000d5238 | 0007786f | 725f7265 | 6c005268 | 2aa85260 | 000d5244 | 000d2fe4 | b464526c | 000d2f64 | 000d5250 | 00066f72 | 5f72656c |
| 1416420 | 000d528c | b4645284 | 000d2e24 | 000d5274 | 0007616e | 645f7265 | 6c0052a4 | b464529c | 000d2c94 | 000d528c | 00086d6f | 72655f72 |
| 1416500 | 656c00bc | 000d5350 | 0000002c | b288b66c | 000003f8 | 7fffffff | 000c6318 | 02000ce5 | 0100147d | 01002d65 | 0000000b | 00002aff |
| 1416560 | 002d2f68 | 6f6d652f | 6f736173 | 312f612f | 73726565 | 2f73656d | 616e7469 | 635f6368 | 65636b31 | 2f736964 | 706c6565 | 78707200 |
| 1416640 | 00302f68 | 6f6d652f | 6f736173 | 312f612f | 73726565 | 2f73656d | 616e7469 | 635f6368 | 65636b31 | 2f73696d | 706c6565 | 7870722e |
| 1416720 | 706c0064 | 000d7778 | 00001f78 | 200a0909 | 09090909 | 09636f6d | 70757465 | 5f657870 | 72284d6f | 64756c65 | 2c52636f | 64652c4d |
| 1417000 | 762c4576 | 292e0a6d | 6f72655f | 72656c20 | 3c2d2d20 | 6c6f6769 | 63616c5f | 6f702861 | 6e642c5f | 2c5f292c | 20212c20 | 616e645f |
| 1417060 | 72656c23 | 52200a09 | 09093c2d | 2076616c | 7565284d | 6f64756c | 652c616e | 64285276 | 2929202d | 3d205223 | 76616c75 | 65284d6f |
| 1417140 | 64756c65 | 2c527629 | 2e0a6d6f | 72655f72 | 656c203c | 2d2d206c | 6f676963 | 616c5f6f | 70286f72 | 2c5f2c5f | 292c2021 | 2c206f72 |
| 1417220 | 5f72656c | 2352200a | 0909093c | 2d207661 | 6c756528 | 4d6f6475 | 6c652c6f | 72285276 | 2929202d | 3d205223 | 76616c75 | 65284d6f |
| 1417300 | 64756c65 | 2c527629 | 2e0a6d6f | 72655f72 | 656c203c | 2d2d206c | 6f676963 | 616c5f6f | 7028786f | 722c5f2c | 5f292c20 | 212c2078 |
| 1417360 | 6f725f72 | 656c2352 | 200a0909 | 093c2d20 | 76616c75 | 65284d6f | 64756c65 | 2c786f72 | 28527629 | 29202d3d | 20522376 | 616c7565 |
| 1417440 | 284d6f64 | 756c652c | 5276292e | 0a6d6f72 | 655f7265 | 6c203c2d | 2d206c6f | 67696361 | 6c5f6f70 | 286e616e | 642c5f2c | 5f292c21 |
| 1417520 | 2c72656c | 2352200a | 09093c2d | 2076616c | 7565284d | 6f64756c | 652c6e61 | 6e642852 | 76292920 | 2d3d2052 | 2376616c | 7565284d |
| 1417600 | 6f64756c | 652c5276 | 292e0a6d | 6f72655f | 72656c20 | 3c2d2d20 | 6c6f6769 | 63616c5f | 6f70286e | 6f722c5f | 2c5f292c | 212c7265 |
| 1417660 | 6c235220 | 0a09093c | 2d207661 | 6c756528 | 4d6f6475 | 6c652c6e | 6f722852 | 76292920 | 2d3d2052 | 2376616c | 7565284d | 6f64756c |
| 1417740 | 652c5276 | 292e0a6d | 6f72655f | 72656c20 | 3c2d2d20 | 5b5d203c | 2d207661 | 6c756528 | 5f2c5b5d | 292e0a0a | 616e645f | 72656c20 |
| 1420020 | 3c2d2d20 | 72656c23 | 52312c6c | 6f676963 | 616c5f6f | 7028616e | 642c5f2c | 5f292c21 | 2c616e64 | 5f72656c | 2352320a | 093c2d20 |
| 1420100 | 76616c75 | 65284d6f | 64756c65 | 2c616e64 | 29523163 | 6f64652c | 5232636f | 64652929 | 202d3d20 | 52312376 | 616c7565 | 284d6f64 |
| 1420160 | 756c652c | 5231636f | 6465292c | 52322376 | 616c7565 | 284d6f64 | 756c652c | 5232636f | 6465292e | 0a616e64 | 5f72656c | 203c2d2d |
| 1420240 | 2072656c | 2352203c | 2d207661 | 6c756528 | 416f6475 | 6c652c52 | 636f6465 | 29202d3d | 20522376 | 616c7565 | 284d6f64 | 756c652c |
| 1420320 | 52636f64 | 65292e0a | 0a6f725f | 72656c20 | 3c2d2d20 | 72656c23 | 52312c6c | 6f676963 | 616c5f6f | 70286f72 | 2c5f2c5f | 292c212c |
| 1420400 | 6f725f72 | 656c2352 | 320a0909 | 3c2d2076 | 616c7565 | 284d6f64 | 756c652c | 6f722852 | 31636f64 | 652c5232 | 636f6465 | 2929202d |
| 1420460 | 3d205231 | 2376616c | 7565284d | 6f64756c | 652c5231 | 636f6465 | 292c5232 | 2376616c | 7565284d | 6f64756c | 652c5232 | 636f6465 |
| 1420540 | 292e0a6f | 725f7265 | 6c203c2d | 2d207265 | 6c235220 | 3c2d2076 | 616c7565 | 284d6f64 | 756c652c | 52636f64 | 6529202d | 3d205223 |
| 1420620 | 76616c75 | 65284d6f | 64756c65 | 2c52636f | 6465292e | 0a0a786f | 725f7265 | 6c203c2d | 2d207265 | 6c235231 | 2c6c6f67 | 6963616c |
| 1420700 | 5f6f7028 | 786f722c | 5f2c5f29 | 2c212c78 | 6f725f72 | 656c2352 | 320a093c | 2d207661 | 6c756528 | 4d6f6475 | 6c652c78 | 6f722852 |
| 1420760 | 31636f64 | 652c5232 | 636f6465 | 2929202d | 3d205231 | 2376616c | 7565284d | 6f64756c | 652c5231 | 636f6465 | 292c5232 | 2376616c |
| 1421040 | 7565284d | 6f64756c | 652c5232 | 636f6465 | 292e0a78 | 6f725f72 | 656c203c | 2d2d2072 | 656c2352 | 203c2d20 | 76616c75 | 65284d6f |
| 1421120 | 64756c65 | 2c52636f | 64652920 | 2d3d2052 | 2376616c | 7565284d | 6f64756c | 652c5263 | 6f646529 | 2e0a0a72 | 656c203c | 2d2d2073 |
| 1421200 | 696d706c | 655f6578 | 70722353 | 652c206d | 6f72655f | 73696d70 | 6c655f65 | 78707273 | 234d203c | 2d207661 | 6c756528 | 4d6f6475 |
| 1421260 | 6c652c72 | 656c2853 | 65636f64 | 652c4d63 | 6f646529 | 29202d3d | 20536523 | 76616c75 | 65284d6f | 64756c65 | 2c536563 | 6f646529 |
| 1421340 | 2c200a09 | 09090909 | 094d2376 | 616c7565 | 284d6f64 | 756c652c | 4d636f64 | 65292e0a | 6d6f7265 | 5f73696d | 706c655f | 65787072 |
| 1421420 | 73203c2d | 2d207265 | 6c5f6f70 | 23526f2c | 20212c20 | 73696d70 | 6c655f65 | 78707223 | 53650a09 | 3c2d2076 | 616c7565 | 284d6f64 |
| 1421500 | 756c652c | 646f7265 | 5f736961 | 706c655f | 65787072 | 73285265 | 6c6f702c | 5365636f | 64652929 | 202d3d20 | 526f2376 | 616c7565 |
| 1421560 | 2852656c | 6f70292c | 20536523 | 76616c75 | 65284d6f | 64756c65 | 2c536563 | 6f646529 | 2e0a6d6f | 72655f73 | 696d706c | 655f6578 |
| 1421640 | 70727320 | 3c2d2d20 | 5b5d203c | 2d207661 | 6c756528 | 5f2c5b5d | 292e0a0a | 72656c5f | 6f70203c | 2d2d2072 | 656c5f6f | 70286e65 |
| 1421720 | 712c5f2c | 5f29203c | 2d207661 | 6c756528 | 6e657129 | 2e0a7265 | 6c5f6f70 | 203c2d2d | 2072656c | 5f6f7028 | 67652c5f | 2c5f2920 |
| 1422000 | 3c2d2076 | 616c7565 | 28676529 | 2e0a7265 | 6c5f6f70 | 203c2d2d | 2072656c | 5f6f7028 | 6c652c5f | 2c5f2920 | 3c2d2076 | 616c7565 |
| 1422060 | 286c6529 | 2e0a7265 | 6c5f6f70 | 203c2d2d | 2072656c | 5f6f7028 | 6c742c5f | 2c5f2920 | 3c2d2076 | 616c7565 | 286c7429 | 2e0a7265 |
| 1422140 | 6c5f6f70 | 203c2d2d | 2072656c | 5f6f7028 | 65712c5f | 2c5f2920 | 3c2d2076 | 616c7565 | 28657129 | 2e0a7265 | 6c5f6f70 | 203c2d2d |
| 1422220 | 2072656c | 5f6f7028 | 67742c5f | 2c5f2920 | 3c2d2076 | 616c7565 | 28677429 | 2e0a0a6d | 6f72655f | 65787072 | 73203c2d | 2d20636f |

```
1422300  616d6131 285f292c 20657870 7223452c 206d6f72 655f6578 70727323 4d65200a 09093c2d 2076616c 7565284d 6f64756c
1422360  652c5b45 76616c7c 4d657661 6c5d2920 243d2045 2376616c 7565284d 6f64756c 652c4576 616c292c 204d6523 76616c75
1422440  65284d6f 64756c65 2c4d6576 616c292e 016d6f72 655f6578 70727320 3c2d2d20 5b5d203c 2d207661 6c756528 5f2c5b5d
1422520  292e0a00 00000000 00000000 00000000 00000000 00000000 00000000 00000000 00000000 00000000 00000000 00000000
1422600  00000000 00000000 00000000 00000000 00000000 00000000 00000000 00000000 00000000 00000000 00000000 00000000
*
1436440  00000000 00000000 00000000 00000000 00000000 00000000 00000000 00000000 00000000 00000000 00000000 000c6710
1436520  01002a6f 00002c07 00000004 000d2c50 000d2c50 00010052 00000000 00080abc 03003b3f 00002c07 0000000c 000d7344
1436600  000d7344 00010052 00000000 00080a3c 03003b1f 00002c07 0000000c 000d7568 000d7568 00010052 00000000 ffffffff
1436660  03004297 00002c07 0000000c 000d73a8 000d73a8 00010052 00000000 2cac0000 0002438a 2ca00000 00000000 00000001
1436740  000d2d5c 000d2d5c 0002438a 000d5218 0007fa3c 06003377 00002c07 00000018 000e53ec 000e53ec 0001005a 00000000
1437020  0007f79c 0300429f 00002c07 0000000c 000d7424 000d7424 00010052 00000000 2cac0000 0002438a 2ca00000 00000000
1437100  00000001 000d2ecc 000d33b4 0002438a 000d521c ffffffff 030042a7 00002c07 0000000c 000d7490 000d7490 00010052
1437160  00000000 0007f7dc 030042af 00002c07 0000000c 000d74dc 000d74dc 00010052 00000000 2b240000 0002438a 000d33c4
1437240  b4640000 000d33f0 000d744c 2cac0000 0002438a 2ca00000 00000000 00000001 000d34c4 000d35e0 0002438a 000d7448
1437320  000c8a08 b4640000 000d3598 000d7464 2b240000 0002438a 000d35f8 b4640000 000d364c 000d74b8 000d759c 06003697
1437400  00002c07 00000018 000e52dc 000e52dc 0001005a 00000000 2cac0000 0002438a 2ca00000 00000000 00000001 000d3720
1437460  000d3844 0002438a 000d74b4 000c8d28 b4640000 000d37f4 000d74d0 2b240000 0002438a 000d3854 b4640000 000d38a8
1437540  000d7504 2cac0000 0002438a 2ca00000 00000000 00000001 000d397c 000d3aa0 0002438a 000d7500 000cf3c0 b4640000
1437620  000d3a50 000d751c 2b240000 0002439a 000d3ab0 b4640000 000d3b04 000d7590 00080a5c 03003b27 00002c07 0000000c
1437700  000d7840 000d7840 00010053 00000000 00080a9c 03003b37 00002c07 0000000c 000d75bc 000d75bc 00010052 00000000
1437760  2cac0000 0002438a 2ca00000 00000000 00000001 000d3bbc 000d3bbc 0002438a 000d758c 000d3bc8 b4640000 000d3c68
1440040  000d75e4 0007ff7c 03003697 00002c07 0000000c 000d7608 000d7608 00010052 00000000 2cac0000 0002438a 2ca00000
1440120  00000000 00000001 000d3d24 000d3e00 0002438a 000d75e0 000cfcb0 b4640000 000d3dd0 000d75fc 2b240000 0002438a
1440200  000d3e10 b4640000 000d3e3c 000d7630 2cac0000 0002438a 2ca00000 00000000 00000001 000d3eec 000d41d0 0002438a
1440260  000d762c 000d7648 b4640000 000d3f48 000d7658 2aa80000 000d7664 000d3f90 03003287 29c80000 000d763c 000d3efc
1440340  b4640000 000d3fdc 000d7670 2aa80000 000d767c 000d4024 b4640000 000d4070 000d7688 2aa80000 000d7694 000d40b8
1440420  b4640000 000d4104 000d76a0 2aa80000 000d76ac 000d414c b4640000 000d4198 000d76c8 2b240000 0002438a 000d41e0
1440500  000a6d6f 72655f65 78707273 00000000 b4640000 000d422c 000d772c 000cfea8 030042b7 00002c07 0000000c 000d7704
1440560  000d7704 00010052 00000000 000a7369 64706c65 65787072 00000000 2cac0000 0002438a 2ca00000 00000000 00000001
1440640  000d42f0 000d43e4 0002438a 000d7728 000d7744 b4640000 000d43b4 000d77d4 2b240000 0002438a 000d43f4 03003287
1440720  29c80000 000d7738 000d4300 00127265 706f7274 5f736576 6572655f 73746d74 000d7774 000c95a8 0009e6f0 000d811c
1441000  00000048 000d7780 000d7790 0000000c 000d778c 000d779c 0000000c 000d7798 000d77a8 0000000c 000d77a4 000d77b4
1441060  0000000c 000d77b0 00000000 0000000c 000d77bc 00076578 70722e70 6c0077c8 00087465 73746578 70720000 b4640000
1441140  0009dd90 000d7864 0007ffdc 060036bf 00002c07 00000018 000e54fc 000e54fc 0001005a 00000000 000c65c4 03002a4f
1441220  00002c07 0000000c 000d78f8 000d78f8 00010053 00000000 ffffffff 030042e7 00002c07 0000000c 000d7928 000d7928
1441300  00010053 00000000 2cac0000 0002438a 2ca00000 00000000 00000001 0009e018 0009e574 0002438a 000d776c b4640000
1441360  0009e0f4 000d787c 2aa80000 000d7888 0009e19c b4640000 0009e268 000d7894 2aa80000 000d78a0 0009e310 b4640000
1441440  0009e4f0 000d78ac 2b240000 0002438a 0009e584 b4640000 0009e62c 000d791c 00080a7c 03003b2f 00002c07 0000000c
1441520  000d7a10 000d7a10 00010053 00000000 ffffffff 030042ef 00002c07 0000000c 000d7b30 000d7b30 00010053 00000000
1441600  2cac0000 0002438a 2ca00000 00000000 00000001 0009e6e4 0009e6e4 0002438a 000d7770 b4640000 0009e790 000d7950
1441660  2cac0000 0002438a 2ca00000 00000000 00000001 0009e85c 0009ec24 0002438a 000d794c 000c8924 b4640000 0009e92c
1441740  000d7968 2aa80000 000d7974 0009e9d0 b4640000 0009ea90 000d7980 2aa80000 000d798c 0009eb34 b4640000 0009ebf4
1442020  000d79a4 2b240000 0002438a 0009ec34 00077072 696d6172 79000000 b4640000 0009f8d0 000d7a38 0008001c 040036cf
1442100  00002c07 00000010 000e581c 000e581c 0001005a 00000000 ffffffff 030042f7 00002c07 0000000c 000d7bec 000d7bec
1442160  00010053 00000000 ffffffff 030042ff 00002c07 0000000c 000d7aa4 000d7aa4 00010053 00000000 2cac0000 0002438a
1442240  2ca00000 00000000 00000001 0009f988 0009fba4 0002438a 000d7a34 000c8e70 b4640000 0009fa34 000d7a50 2aa80000
1442320  000d7a7c 0009fab0 b4640000 0009fb34 000d7a88 ffffffff 06003367 00002c07 00000018 000e571c 000e571c 0001005a
1442400  00000000 2b240000 0002438a 0009fbb4 b4640000 0009fc3c 000d7acc 03003287 29c80000 000d80c4 000af040 2cac0000
1442460  0002438a 2ca00000 00000000 00000001 0009fce4 0009fdac 0002438a 000d7ac8 000d7ae4 b4640000 0009fd7c 000d7af4
1442540  2b240000 0002438a 0009fdbc 03003287 29c80000 000d7a18 0009fcf4 b4640000 0009fde8 000d7b58 000c656e 74697479
1442620  5f636c61 73730000 0007fa7c 06003387 00002c07 00000018 000e560c 000e560c 0001005a 00000000 2cac0000 0002438a
1442700  2ca00000 00000000 00000001 0009febc 000a0294 0002438a 000d7b54 000d7b70 b4640000 0009ff8c 000d7b80 2aa80000
1442760  000d7b8c 000a0038 03003287 29c80000 000d7b64 0009fecc b4640000 000a00f8 000d7b98 2aa80000 000d7ba4 000a01a4
1443040  b4640000 000a0264 000d7bb0 2b240000 0002438a 000a02a4 b4640000 000a02d0 000d7c20 03003287 29c80000 000d80e8
```

| | | | | | | | | | | | | |
|---|---|---|---|---|---|---|---|---|---|---|---|---|
| 1443120 | 000aeda4 | 0009a820 | 03004307 | 00002c07 | 0000000c | 000d7f24 | 000d7f24 | 00010053 | 00000000 | 2cac0000 | 0002438a | 2ca00000 |
| 1443200 | 00000000 | 00000001 | 000a0354 | 000a0720 | 0002438a | 000d7c10 | 000d7c58 | 0006666e | 63616c6c | 00000000 | b4640000 | 000a03b4 |
| 1443260 | 000d7c68 | 0007f87c | 0300430f | 00002c07 | 0000000c | 000e2644 | 000e2644 | 00010057 | 00000000 | 2aa80000 | 000d7c74 | 000a0414 |
| 1443340 | 03003287 | 29c80000 | 000d7c4c | 000a0364 | b4640000 | 000a0468 | 000d7c80 | 2aa80000 | 000d7c8c | 000a04c8 | b4640000 | 000a051c |
| 1443420 | 000d7ca4 | 2aa80000 | 000d7cd0 | 000a0594 | 00096167 | 67726567 | 61746500 | b4640000 | 000a061c | 000d7cdc | 0007f89c | 03004317 |
| 1443500 | 00002c07 | 0000000c | 000d7dec | 000d7dec | 00010053 | 00000000 | 2aa80000 | 000d7d08 | 000a067c | b4640000 | 000a06d0 | 000d7d14 |
| 1443560 | ffffffff | 0300431f | 00002c07 | 0000000c | 000d7d30 | 000d7d30 | 00010053 | 00000000 | 2b240000 | 0002438a | 000a0730 | b4640000 |
| 1443640 | 000a0784 | 000d7d58 | 0000435f | b3287eb0 | 000aebfc | 00000000 | 2cac0000 | 0002438a | 2ca00000 | 00000000 | 00000001 | 000a0888 |
| 1443720 | 000a09f4 | 0002438a | 000d7d54 | 000d7d70 | b4640000 | 000a0950 | 000d7d90 | 2b240000 | 0002438a | 000a0a04 | 03003287 | 29c80000 |
| 1444000 | 000d7d64 | 000a0898 | 000d656c | 656d656e | 745f6173 | 736f6300 | b4640000 | 000a0af8 | 000d7e20 | 000a6173 | 73657274 | 6f6e6365 |
| 1444060 | 00000000 | 000a890c | 03004327 | 00002c07 | 0000000c | 000d7e7c | 000d7e7c | 00010053 | 00000000 | 000b4d5c | 0300432f | 00002c07 |
| 1444140 | 0000000c | 000d7ec0 | 000d7ec0 | 00010053 | 00000000 | 2cac0000 | 0002438a | 2ca00000 | 00000000 | 00000001 | 000a0bc8 | 000a0bc8 |
| 1444220 | 0002438a | 000d7e10 | 000a0bd4 | 00076368 | 6f696365 | 73000000 | b4640000 | 000a0cb4 | 000d7ea4 | 000a4174 | 74726962 | 75746520 |
| 1444300 | 00000000 | 0007f93c | 03004337 | 00002c07 | 0000000c | 000daf88 | 000daf88 | 00010054 | 00000000 | 0007ff5c | 0400367f | 00002c07 |
| 1444360 | 00000010 | 000e5914 | 000e5914 | 0001005a | 00000000 | 2cac0000 | 0002438a | 2ca00000 | 00000000 | 00000001 | 000a279c | 000a279c |
| 1444440 | 0002438a | 000d7ea0 | 000a27a8 | b4640000 | 000a2864 | 000d7ee8 | 0000435f | b3280000 | 000aebd0 | 00000000 | 2cac0000 | 0002438a |
| 1444520 | 2ca00000 | 00000000 | 00000001 | 000a28cc | 000a28cc | 0002438a | 000d7ee4 | 000a28d8 | b4640000 | 000a2908 | 000d7f4c | 000d7369 |
| 1444600 | 61706c65 | 65787072 | 2e706c00 | 000b842c | 0000374f | 00002c07 | 00000024 | 000e5afc | 000e5afc | 0001005a | 00000000 | 2cac0000 |
| 1444660 | 0002438a | 2ca00000 | 00000000 | 00000001 | 000a2a6c | 000a387c | 0002438a | 000d7f48 | 000d7f84 | b4640000 | 000a2c60 | 000d7f94 |
| 1444740 | 000b817c | 0a003747 | 00002c07 | 00000028 | 000e5c5c | 000e5c5c | 0001005a | 00000000 | 2aa80000 | 000d7fa0 | 000a2dc8 | 03003287 |
| 1445020 | 29c80000 | 000d7f78 | 000a2a7c | b4640000 | 000a2fe4 | 000d7fac | 2aa80000 | 000d7fb8 | 000a3108 | b4640000 | 000a32cc | 000d7fc4 |
| 1445100 | 2aa80000 | 000d7ff0 | 000a341c | b4640000 | 000a3618 | 000d7ffc | 000803bc | 0600380f | 00002c07 | 00000018 | 000e5da8 | 000e5da8 |
| 1445160 | 0001005a | 00000000 | 2aa80000 | 000d8008 | 000a36c0 | b4640000 | 000a37b4 | 000d8020 | 2aa80000 | 000d804c | 000a37fc | 00096368 |
| 1445240 | 61726163 | 74657200 | b4640000 | 000a3844 | 000d8100 | 000b8468 | 05003757 | 00002c07 | 00000014 | 000e5ea8 | 000e5ea8 | 0001005a |
| 1445320 | 00000000 | 2b240000 | 0002438a | 000a388c | b4640000 | 000afaf8 | 000da2c8 | 00106368 | 65636b5f | 73656d61 | 6e746963 | 73310000 |
| 1445400 | 2aa8805c | 000da2bc | 000af840 | 000e6361 | 73655f73 | 746d745f | 616c7473 | 000d8064 | 000d7a94 | 000d7bbc | b464807c | 000af668 |
| 1445460 | 000d8058 | 0009636f | 6e646974 | 696f6e00 | b46480b0 | 000af1cc | 000d80a0 | 2b2480bc | 0002438a | 000af194 | b46480c8 | 000af144 |
| 1445540 | 000d80b8 | b46480d4 | 000aef30 | 000d80d0 | 2b2480e0 | 0002438a | 000aeef8 | b46480ec | 000aeea8 | 000d80dc | b46480f8 | 000aec68 |
| 1445620 | 000d80f4 | 00087365 | 715f7374 | 6d740018 | 000d8218 | 0000002c | b288b66c | 000004cb | 7fffffff | 000a8b24 | 02000ce5 | 0100147d |
| 1445700 | 01002d65 | 0000000b | 00002aff | 002d2f68 | 6f6d652f | 6f736173 | 312f612f | 73726565 | 2f73656d | 616e7469 | 635f6368 | 65636b31 |
| 1445760 | 2f636f6e | 63757272 | 656e7400 | 00302f68 | 6f6d652f | 6f736173 | 312f612f | 73726565 | 2f73656d | 616e7469 | 635f6368 | 65636b31 |
| 1446040 | 2f636f6e | 63757272 | 656e742e | 706c0065 | 0000002c | 000db494 | b27cb66c | 000004cd | 7fffffff | 000aebcc | 02000ce5 | 0200293d |
| 1446120 | 0000448f | 000002ab | 00002aff | 0000002c | 000db4c0 | b27cb66c | 000004de | 7fffffff | 000aebf8 | 02000ce5 | 02001f6d | 0000448f |
| 1446200 | 00002c07 | 00002aff | 000e6675 | 6c6c5f74 | 7970655f | 6465636c | 00000000 | 000d8298 | 0000002c | b27cb66c | 000004cf | 000004dd |
| 1446260 | 0009cbc1 | 02000ce5 | 02002385 | 0000448f | 00002c07 | 00002aff | 00000054 | 000a9448 | b27cb66c | 000004d0 | 7fffffff | 000d8354 |
| 1446340 | 02000ce5 | 020031ed | 020031e5 | 00003fc7 | 02000885 | 00004497 | 0000000c | 020031f5 | 01003ebd | 00000010 | 02000885 | 0000000e |
| 1446420 | 01003ebd | 00000012 | 00002aff | 000d843c | 00000064 | b27cb66c | 000004d1 | 000004df | 000d8440 | 02000ce5 | 05001b0d | 00003fc7 |
| 1446500 | 0000001b | 00002c07 | 00676881 | 000002ab | 00002aff | 000d843c | 0000002c | b4f0b4e4 | 000004d0 | 7fffffff | 0007eaad | 00000000 |
| 1446560 | 00000000 | 000d880c | 0002438a | 000d45f0 | 2c780054 | 0002438a | 54100000 | 03003287 | 4b8c0000 | 00003fc7 | 60cc56f8 | 671c5370 |
| 1446640 | 581867b8 | 53705c30 | 020031f7 | 65300018 | 5e540000 | 01003ebf | 67b85ec0 | 00000018 | 02000887 | 6b7458e0 | 01003ebf | 6c3422bc |
| 1446720 | 000dd468 | 000000ec | 000d8248 | b27cb66c | 000004d2 | 7fffffff | 000d85cc | 02000ce5 | 020031ed | 020031e5 | 00004497 | 02000a3d |
| 1447000 | 02000885 | 000043d7 | 0000003c | 02000a3d | 03003695 | 000036af | 00000010 | 00000014 | 02000a3d | 02000885 | 0000449f | 00000018 |
| 1447060 | 02000a3d | 02000885 | 000044a7 | 0000001c | 0100371d | 00000016 | 020031f5 | 01003ebd | 00000020 | 02000a3d | 02000885 | 0000000e |
| 1447140 | 0200412d | 00000022 | 00000024 | 02000a3d | 02000885 | 0000001a | 01003ff5 | 00000028 | 02000a3d | 02000885 | 0000001e | 02003ebd |
| 1447220 | 00000022 | 0000002c | 02000cdd | 00000022 | 01001b85 | 02003ac5 | 00000030 | 030043fd | 00000026 | 0000002a | 0000002e | 00002aff |
| 1447300 | 000d8654 | 00000038 | b27cb66c | 000004d3 | 000004e0 | 000d8658 | 02000ce5 | 05001b0d | 00004497 | 0000001b | 00002c07 | 006ea343 |
| 1447360 | 000002ab | 00002aff | 2c780154 | 0002438a | 51100000 | 03003287 | 4b8c0000 | 00004497 | 60cc56f8 | 671c55f0 | 687c002c | 55f06af0 |
| 1447440 | 002455f0 | 6af0001c | 55f06a00 | 53705818 | 67b85370 | 5e540000 | 020031f7 | 66700018 | 5c9c0018 | 01003ebf | 67ec0020 | 5e540000 |
| 1447520 | 02000a3f | 66700018 | 5c9c0018 | 02000887 | 6b7458e0 | 0200412f | 6c840020 | 67ec001c | 5e540000 | 02000a3f | 66700018 | 5c9c0018 |
| 1447600 | 02000887 | 6e580024 | 5a180000 | 01003ff7 | 67ec0018 | 5e540000 | 02000a3f | 65300024 | 5e540000 | 02000887 | 6e58001c | 5a180000 |
| 1447660 | 02003ebf | 6c840020 | 67b85ec0 | 00000024 | 02000cdf | 6c840020 | 5a180000 | 01001b87 | 5a180000 | 02003ac7 | 5fa058e0 | 030043ff |
| 1447740 | 6c84001c | 6c840018 | 6c34477c | 34100030 | 24d00000 | 000da4a4 | 00343540 | 001c0028 | 3fe40018 | 003038fc | 002c33a0 | 320c42ac |
| 1450020 | 000036af | 000d7480 | 002c3410 | 00203e70 | 00283c9c | 00000024 | 000dd4c4 | 002433d8 | 3e700020 | 3af4001c | 000dd4e4 | 001c38e8 |
| 1450100 | 3d6c37f0 | 3cf4234c | 000cc8c0 | 0000008c | 000d8354 | b27cb66c | 000004d4 | 7fffffff | 000d8730 | 02000ce5 | 020031ed | 020031e5 |
| 1450160 | 000044a7 | 02000a3d | 02000885 | 000044af | 0000000c | 02000885 | 000043f7 | 00000010 | 020031f5 | 02003ebd | 00000014 | 020044b5 |

```
1450240  00000018 0000001c 02000a34 02000885 0000000e 02003ff5 00000016 0000001a 02000885 00000012 02003ff5 00000016
1450320  0000001e 00002aff 000d8768 00000038 b27cb66c 00000445 000004e1 000d876c 02000ce5 05001b0d 000044a7 0000001b
1450400  00002c07 006ea723 000002ab 00002aff 2c7800a0 0002438a 5d100000 03003287 4b8c0000 000044a7 60cc56f8 671c55f0
1450460  682c5370 581867b8 53705c30 020031f7 6530001c 5e540000 02003ebf 67ec0018 5a180000 020044b7 66700020 5c9c001c
1450540  02000a3f 66c00024 001c5ec0 00000024 02000887 6b7458e0 02003ff7 6c840018 6c840020 5c9c001c 02000887 6d3c58e0
1450620  02003ff7 6c840018 6c344768 33bc247c 000dd540 0018386c 3d302340 000da514 0000003c 000d85cc b27cb66c 000004d6
1450700  7fffffff 000d87d4 02000ce5 020031ed 020031e5 000044af 00000007 02003ff5 0000000c 00000007 00002aff 000d8808
1450760  00000038 b27cb66c 000004d7 000004e2 000d880c 02000ce5 05001b0d 000044af 0000001b 00002c07 006eaa03 000002ab
1451040  00002aff 2c780030 0002438a 5d100000 03003287 4b8c0000 000044af 537055f0 671c5370 5d100000 02003ff7 5fa05370
1451120  4960228c 00000038 000d8730 b27cb66c 000004d8 7fffffff 000d8874 02000ce5 020031ed 020031e5 0000449f 00000007
1451200  01003ff5 00000007 00002aff 000d8a20 00000038 b130b66c 000004d9 000004e3 000d82d5 02000ce5 05001b0d 0000449f
1451260  0000001b 00002c07 006ea623 000002ab 00002aff 27f0002e 000d88ac 5d100000 03003287 4b8c0000 0000449f 537055f0
1451340  671c5370 5d100000 01003ff7 53704960 228c6c74 00000040 000d87d4 b27cb66c 000004da 7fffffff 000d8900 02000ce5
1451420  020031ed 020031e5 0000449f 02003645 0000345f 0000000c 01003ff5 0000345f 00002aff 28c4004c 000d8938 5d100000
1451500  03003287 4b8c0000 0000449f 60cc56f8 671c5370 581867b8 53705c30 01003ff7 4b8c0000 0000345f 36a43724 0018362c
1451560  320c41d4 0000345f 239c0000 000cc5cc 00000040 000d8874 b27cb66c 000004db 7fffffff 000db5c8 02000ce5 020031ed
1451640  020031e5 0000449f 02003645 00003527 0000000c 01003ff5 00003527 00002aff 2954004c 0002438a 5d100000 03003287
1451720  4b8c0000 0000449f 60cc56f8 671c5370 581867b8 53705c30 01003ff7 4b8c0000 00003527 36a43724 0018362c 320c41d4
1452000  00003527 239c0000 000cc5cc 00000098 000dd30c b27cb66c 00000513 7fffffff 000d8b14 02000ce5 020031ed 020031e5
1452060  00004597 02000a3d 0100413d 0000000c 02000a3d 02000895 00004427 00000010 02000885 00004597 00000014 020031f5
1452140  02004005 00000018 00000001 0000001c 00000020 02000a3d 02000885 00000012 02004005 0000001a 0000001e 02000885
1452220  00000016 02004005 0000001a 00000022 00002aff 000d8c70 00000038 b27cb66c 00000514 00000555 000d8c74 02000ce5
1452300  05001b0d 00004597 0000001b 00002c07 006fe1c3 000002b3 00002aff 27f000b8 000d8b48 5d100000 03003287 4b8c0000
1452360  00004597 60cc56f8 671c55f0 686855f0 63b05370 581867b8 53705c30 020031f7 6530001c 5e540000 02004007 67ec0018
1452440  55f06670 00205ec0 0000001c 02000a3f 66c00024 001c5ec0 00000024 02000887 6e0858e0 02004007 6c840018 6c840020
1452520  5c9c001c 02000887 6d3c58e0 02004007 6c840018 6c344768 34a0001c 364035c8 31f0247c 000d0090 002033bc 3e70001c
1452600  3c480000 000da91c 0018386c 3d302340 000dfc38 0000003c 000d898c b27cb66c 00000515 7fffffff 000d8b80 02000ce5
1452660  020031ed 020031e5 00004597 00000007 02004005 0000000c 00000007 00002aff 29540030 0002438a 5d100000 03003287
1452740  4b8c0000 00004597 537055f0 671c5370 5d100000 02004007 5fa05370 4960228c 000000f4 000d8b14 b27cb66c 00000516
1453020  7fffffff 000d8e24 02000ce5 020031ed 020031e5 00004557 02000a3d 02003645 000033c7 0000000c 02000a3d 010036d5
1453100  00000010 02000a3d 02000895 0000459f 00000014 02000a3d 02000885 000045a7 00000018 02000a3d 010036dd 0000001c
1453160  02000a3d 02003645 00003497 00000020 02000885 00003c57 00000024 020031f5 02004005 00000028 020045ad 00000001
1453240  0000002c 00000030 00000034 02000a3d 02000885 00000016 02004005 0000002a 0000002e 02000a3d 02000885 0000001a
1453320  02004005 0000002a 00000032 02000885 00000026 02004005 0000002a 00000036 00002aff 000d8e98 00000038 b27cb66c
1453400  00000517 00000556 000d8e9c 02000ce5 05001b0d 00004557 0000001b 00002c07 006fc563 000002b3 00002aff 2c780178
1453460  0002438a 5d100000 03003287 4b8c0000 00004557 60cc56f8 671c55f0 687c0038 55f06af0 003055f0 6af00028 55f06af0
1453540  002055f0 6aa055f0 69b05370 581867b8 53705c30 020031f7 6530001c 5e540000 02004007 67ec0018 5a180000 020045af
1453620  66700020 58780020 66c00024 00205ec0 0000001c 02000a3f 66c00028 001c5ec0 00000028 02000887 6e580030 5a180000
1453700  02004007 6c840018 6c840024 5c9c001c 02000a3f 66c00024 001c5ec0 00000024 02000887 6e580028 5a180000 02004007
1453760  6c840018 6c840020 5c9c001c 02000887 613c58e0 02004007 6c840018 6c3436a4 47683540 0018003c 362c320c 43000000
1454040  000033c7 000cc5cc 004034a0 00343eec 003c382c 003831f0 24d00000 000cf098 00383410 002c3e70 00343c9c 00000030
1454120  000dfdbc 00303410 00243e70 002c3c9c 00000028 000dfddc 002834a0 001c3eec 0024382c 002031f0 24d00000 000cf0d8
1454200  002034e0 00183f68 001c3880 320c42ac 00003497 000cc5cc 0018386c 3d302340 000cfbb4 00000078 000d8b80 b27cb66c
1454260  00000518 7fffffff 000d8f64 02000ce5 020031ed 020031e5 0000459f 02000a3d 02000885 00003c5f 0000000c 02000a3d
1454340  02003645 000034cf 00000010 010036b5 00000014 020031f5 02004005 00000018 0000001c 02000885 0000000e 02004005
1454420  0000001a 0000001e 00002aff 000d8ff8 00000038 b27cb66c 00000519 00000557 000d8ffc 02000ce5 05001b0d 0000459f
1454500  0000001b 00002c07 006fede3 000002b3 00002aff 2c780090 0002438a 5d100000 03003287 4b8c0000 0000459f 60cc56f8
1454560  671c55f0 686855f0 69b05370 581867b8 53705c30 020031f7 6530001c 5e540000 02004007 66700018 5c9c001c 02000887
1454640  6b7458e0 02004007 6c840018 6c344768 3410001c 24d00000 000cf0f9 002034e0 00183f68 001c3880 320c42ac 000034cf
1454720  000cc5cc 001838d4 3d6037dc 31f0234c 000dfe40 00000098 000d8e24 b27cb66c 0000051a 7fffffff 000d90ec 02000ce5
1455000  020031ed 020031e5 000045a7 02000a3d 0100413d 0000000c 02000a3d 02000885 0000459f 00000010 02000885 000045a7
1455060  00000014 020031f5 02004005 00000018 00000001 0000001c 00000020 02000a3d 02000885 00000012 02004005 0000001a
1455140  0000001e 02000885 00000016 02004005 0000001a 00000022 00002aff 000d9284 00000038 b27cb66c 0000051b 00000558
1455220  000d9288 02000ce5 05001b0d 000045a7 0000001b 00002c07 006feee3 000002b3 00002aff 27f000b8 000d9120 5d100000
1455300  03003287 4b8c0000 000045a7 60cc56f8 671c55f0 686855f0 69b05370 581867b8 53705c30 020031f7 6530001c 5e540000
```

| | | | | | | | | | | | | |
|---|---|---|---|---|---|---|---|---|---|---|---|---|
| 1455360 | 02004007 | 67ec0018 | 55f06670 | 00205ec0 | 0000001c | 02000a3f | 66c00024 | 001c5ec0 | 00000024 | 02000887 | 6e0858e0 | 02004007 |
| 1455440 | 6c840018 | 6c840020 | 5c9c001c | 02000887 | 6d3c58e0 | 02004007 | 6c840018 | 6c344768 | 34a0001c | 364035c8 | 31f0247c | 000d0090 |
| 1455520 | 002033bc | 3e70001c | 3c480000 | 000dfdbc | 0018386c | 3d302340 | 000dfddc | 0000003c | 000d8f64 | b27cb66c | 0000051c | 7fffffff |
| 1455600 | 000d9158 | 02000ce5 | 020031ed | 020031e5 | 000045a7 | 00000007 | 02004005 | 0000000c | 00000007 | 00002aff | 29540030 | 0002438a |
| 1455660 | 5d100000 | 03003287 | 4b8c0000 | 000045a7 | 537055f0 | 671c5370 | 5d100000 | 02004007 | 5fa05370 | 4960228c | 00000130 | 000d90ec |
| 1455740 | b27cb66c | 0000051d | 7fffffff | 000d94c8 | 02000ce5 | 020031ed | 020031e5 | 00003edf | 02000a3d | 02003645 | 0000350f | 0000000c |
| 1456020 | 02000a3d | 02003645 | 00000010 | 00000014 | 02000a3d | 02003645 | 0000226f | 00000018 | 02000a3d | 02000885 | 00003c57 | 0000001c |
| 1456100 | 0100371d | 00000016 | 020031f5 | 01003ebd | 00000020 | 02000d0d | 02000a65 | 02000d0d | 02003bd5 | 02003ac5 | 00000024 | 0200352d |
| 1456160 | 00000012 | 00000028 | 00000022 | 02003bd5 | 02003ac5 | 0000002c | 02003504 | 00000012 | 00000030 | 00000022 | 02000a3d | 01002ced |
| 1456240 | 000045b7 | 02000a3d | 01002ced | 00000012 | 02000a3d | 01002ced | 00003ad7 | 02000a3d | 01002ced | 00000016 | 00002527 | 02000a3d |
| 1456320 | 02000885 | 0000001e | 02004005 | 00000022 | 00000034 | 02000cdd | 00000022 | 01001b85 | 02003ac5 | 00000016 | 0200350d | 00000012 |
| 1456400 | 00000036 | 00002aff | 000d9550 | 00000038 | b27cb66c | 0000051e | 00000559 | 000d9554 | 02000ce5 | 05001b0d | 00003edf | 0000001b |
| 1456460 | 00002c07 | 00663a63 | 000002b3 | 00002aff | 2c780208 | 0002438a | 5d100000 | 03003287 | 4b8c0000 | 00003edf | 60cc56f8 | 671c55f0 |
| 1456540 | 687c0030 | 55f06af0 | 002455f0 | 6af0001c | 55f06a00 | 53705818 | 67b85370 | 5e540000 | 020031f7 | 66700018 | 5c9c0018 | 01003ebf |
| 1456620 | 67ec0018 | 5e540000 | 02000d0f | 6670001c | 5c9c001c | 02000a67 | 66c00020 | 001c5ec0 | 00000020 | 02000d0f | 66c00024 | 00205ec0 |
| 1456700 | 00000024 | 02003bd7 | 67ec0024 | 6c840018 | 5c9c0024 | 02003ac7 | 5fa058e0 | 0200352f | 6af0002c | 5fa05ec0 | 00000020 | 02003bd7 |
| 1456760 | 67ec0020 | 6c840018 | 5c9c0020 | 02003ac7 | 5fa058e0 | 0200350f | 6e58002c | 5fa05ec0 | 0000001c | 02000a3f | 66c00020 | 001c5ec0 |
| 1457040 | 00000020 | 01002cef | 4b8c0000 | 000045b7 | 5c9c001c | 02000a3f | 66c00020 | 001c5ec0 | 00000020 | 01002cef | 6e58002c | 5c9c001c |
| 1457120 | 02000a3f | 66c00020 | 001c5ec0 | 00000020 | 01002cef | 4b8c0000 | 00003ad7 | 5c9c001c | 02000a3f | 67ec001c | 4b8c0000 | 00002527 |
| 1457200 | 5c9c001c | 01002cef | 69b05c30 | 02000a3f | 6530001c | 5e540000 | 02000887 | 6e58001c | 5a180000 | 02004007 | 6c840018 | 67b85ec0 |
| 1457260 | 0000001c | 02000cdf | 6c840018 | 5a180000 | 01001b87 | 5a190000 | 02003ac7 | 6d3c58e0 | 0200350f | 6e58002c | 6c3436a4 | 477c3540 |
| 1457340 | 00180034 | 362c320c | 43000000 | 0000350f | 000cc5cc | 00383540 | 00180028 | 3f680034 | 38940030 | 37dc3c9c | 0000002c | 000cc5cc |
| 1457420 | 002c3540 | 00180020 | 3f680029 | 38940024 | 320c42ac | 0000226f | 000cc5cc | 002433d8 | 3e700020 | 3af4001c | 000cfbb4 | 001c38e8 |
| 1457500 | 316c2330 | 000cc8c0 | 0000008c | 000d9158 | b27cb66c | 0000051f | 7fffffff | 000d962c | 02000ce5 | 020031ed | 020031e5 | 00003c57 |
| 1457560 | 02000a3d | 02000885 | 00003c5f | 0000000c | 02000885 | 000045bf | 00000010 | 020031f5 | 02004005 | 00000014 | 02003c55 | 00000018 |
| 1457640 | 0000001c | 02000a3d | 02000885 | 0000000e | 02004005 | 00000016 | 0000001a | 02000885 | 00000012 | 02004005 | 00000016 | 0000001e |
| 1457720 | 00002aff | 000d97e0 | 00000038 | b27cb66c | 00000520 | 0000055a | 000d97e4 | 02000ce5 | 05001b0d | 00003c57 | 0000001b | 00002c07 |
| 1460000 | 0067dda3 | 000002b3 | 00002aff | 27f000a0 | 000d9688 | 5d100000 | 03003287 | 4b8c0000 | 00003c57 | 60cc56f8 | 671c55f0 | 682c5370 |
| 1460060 | 581867b8 | 53705c30 | 020031f7 | 6530001c | 5e540000 | 02004007 | 67ec0018 | 5a180000 | 02003c57 | 66700020 | 5c9c001c | 02000a3f |
| 1460140 | 66c00024 | 001c5ec0 | 00000024 | 02000887 | 6b7458e0 | 02004007 | 6c840018 | 6c840020 | 5c9c001c | 02000887 | 6d3c58e0 | 02004007 |
| 1460220 | 6c840018 | 6c344768 | 33bc247c | 000cf0f8 | 0018386c | 3d302340 | 000dff84 | 00000064 | 000d94c8 | b27cb66c | 00000521 | 7fffffff |
| 1460300 | 000d96f4 | 02000ce5 | 020031ed | 020031e5 | 00003c57 | 02000885 | 00003c5f | 0000000c | 020031f5 | 02004005 | 00000010 | 02003c55 |
| 1460360 | 00000014 | 00000007 | 02000885 | 0000000e | 02004005 | 00000012 | 00000016 | 00002aff | 29540064 | 0002438a | 5d100000 | 03003287 |
| 1460440 | 4b8c0000 | 00003c57 | 60cc56f8 | 671c5370 | 581867b8 | 53705c30 | 020031f7 | 6530001c | 5e540000 | 02004007 | 67ec0018 | 5a180000 |
| 1460520 | 02003c57 | 67b85370 | 5c9c001c | 02000887 | 6b7458e0 | 02004007 | 6c840018 | 6c3422bc | 000cf0f8 | 000000f0 | 000d962c | b27cb66c |
| 1460600 | 00000522 | 7fffffff | 000d9990 | 02000ce5 | 020031ed | 020031e5 | 00003c5f | 02000885 | 000024ff | 0000000c | 020031f5 | 02004005 |
| 1460660 | 00000010 | 02003c54 | 00000014 | 00000018 | 02000a3d | 02000885 | 0000000e | 02004124 | 00000012 | 00000016 | 02000d0d | 02003bd5 |
| 1460740 | 02003ac5 | 0000001c | 02003524 | 00000016 | 0000001a | 00000012 | 02000d0d | 02003bd5 | 02003ac5 | 00000020 | 0200350d | 00000016 |
| 1461020 | 0000001a | 00000012 | 02000a3d | 02000885 | 0000000e | 010045c5 | 00000024 | 02000a3d | 01002ced | 000045cf | 02000a3d | 01002ced |
| 1461100 | 00000016 | 02000a3d | 01002ced | 00003ad7 | 02000a3d | 01002ced | 00000026 | 00002527 | 00002aff | 000d99e8 | 00000038 | b27cb66c |
| 1461160 | 00000523 | 0000055b | 000d99ec | 02000ce5 | 05001b0d | 00003c5f | 0000001b | 00002c07 | 006787c3 | 000002b3 | 00002aff | 2c780174 |
| 1461240 | 0002438a | 5d100000 | 03003287 | 4b8c0000 | 00003c5f | 60cc56f8 | 671c5370 | 581867b8 | 53705c30 | 020031f7 | 66700018 | 5c9c0018 |
| 1461320 | 02004007 | 67ec0024 | 5a180000 | 02003c5f | 65c0001c | 00185c30 | 02000a3f | 66700020 | 5c9c0020 | 02000887 | 6b7458e0 | 0200412f |
| 1461400 | 6c840024 | 6c84001c | 5e540000 | 02000d0f | 66700020 | 5c9c0020 | 02003bd7 | 67ec0020 | 6c840024 | 5c9c0020 | 02003ac7 | 5fa058e0 |
| 1461460 | 0200352f | 6c84001c | 6c840018 | 5e540000 | 02000d0f | 66700020 | 5c9c0020 | 02003bd7 | 67ec0020 | 6c840024 | 5c9c0020 | 02003ac7 |
| 1461540 | 5fa058e0 | 0200350f | 6c84001c | 6c840018 | 5e540000 | 02000a3f | 65300018 | 5e540000 | 02000887 | 6b7458e0 | 010045c7 | 67b85ec0 |
| 1461620 | 00000018 | 02000a3f | 66c00020 | 00185ec0 | 00000020 | 01002cef | 4b8c0000 | 000045cf | 5c9c0018 | 02000a3f | 66c00020 | 00185ec0 |
| 1461700 | 00000020 | 01002cef | 6c84001c | 5c9c0018 | 02000a3f | 66c0001c | 00185ec0 | 0000001c | 01002cef | 4b8c0000 | 00003ad7 | 5c9c0018 |
| 1461760 | 02000a3f | 67ec0018 | 4b8c0000 | 00002527 | 5c9c0018 | 01002cef | 6c3422bc | 000cfff0 | 0000005c | 000d96f4 | b27cb66c | 00000524 |
| 1462040 | 7fffffff | 000d9a7c | 02000ce5 | 020031ed | 020031e5 | 000045bf | 02000885 | 0000456f | 0000000c | 020031f5 | 02004005 | 00000010 |
| 1462120 | 00000014 | 02000885 | 0000000e | 02004005 | 00000012 | 00000016 | 00002aff | 000d9b88 | 00000038 | b27cb66c | 00000525 | 0000055c |
| 1462200 | 000d9b8c | 02000ce5 | 05001b0d | 000045bf | 0000001b | 00002c07 | 006ffc23 | 000002b3 | 00002aff | 27f00058 | 000d9ad0 | 5d100000 |
| 1462260 | 03003287 | 4b8c0000 | 000045bf | 60cc56f8 | 671c5370 | 581867b8 | 53705c30 | 020031f7 | 6530001c | 5e540000 | 02004007 | 66700018 |
| 1462340 | 5c9c001c | 02000887 | 6b7458e0 | 02004007 | 6c840018 | 6c3422bc | 000df9b4 | 0000005c | 000d9990 | b27cb66c | 00000526 | 7fffffff |
| 1462420 | 000d9b30 | 02000ce5 | 020031ed | 020031e5 | 000045bf | 02000885 | 00004587 | 0000000c | 020031f5 | 02004005 | 00000010 | 00000014 |

| | | | | | | | | | | | | |
|---|---|---|---|---|---|---|---|---|---|---|---|---|
| 1462500 | 02000885 | 0000000e | 02004005 | 00000012 | 00000016 | 00002aff | 29540058 | 0002438a | 5d100000 | 03003287 | 4b8c0000 | 000045bf |
| 1462560 | 60cc56f8 | 671c5370 | 581867b8 | 53705c30 | 020031f7 | 6530001c | 5e540000 | 02004007 | 66700018 | 5c9c001c | 02000887 | 6b7458e0 |
| 1462640 | 02004007 | 6c840018 | 6c3422bc | 000dfbbc | 0000005c | 000d9a7c | b27cb66c | 00000527 | 7fffffff | 000d9c1c | 02000ce5 | 020031ed |
| 1462720 | 020031e5 | 000024ff | 02000885 | 00004547 | 0000000c | 020031f5 | 0200412d | 00000010 | 00000014 | 02000885 | 0000000e | 0200412d |
| 1463000 | 00000012 | 00000016 | 00002aff | 000da004 | 00000038 | b27cb66c | 00000528 | 0000055d | 000da008 | 02000ce5 | 05001b0d | 000024ff |
| 1463060 | 0000001b | 00002c07 | 0067ff83 | 000002b3 | 00002aff | 27f00058 | 000d9c70 | 5d100000 | 03003287 | 4b8c0000 | 000024ff | 60cc56f8 |
| 1463140 | 671c5370 | 581867b8 | 53705c30 | 020031f7 | 6530001c | 5e540000 | 0200412f | 66700018 | 5c9c001c | 02000887 | 6b7458e0 | 0200412f |
| 1463220 | 6c840018 | 6c3422bc | 000e00e4 | 0000005c | 000d9b30 | b27cb66c | 00000529 | 7fffffff | 000d9cd0 | 02000ce5 | 020031ed | 020031e5 |
| 1463300 | 000024ff | 02000885 | 00004457 | 0000000c | 020031f5 | 0200412d | 00000010 | 00000014 | 02000885 | 0000000e | 0200412d | 00000012 |
| 1463360 | 00000016 | 00002aff | 28c40058 | 000d9d24 | 5d100000 | 03003287 | 4b8c0000 | 000024ff | 60cc56f8 | 671c5370 | 581867b8 | 53705c30 |
| 1463440 | 020031f7 | 6530001c | 5e540000 | 0200412f | 66700018 | 5c9c001c | 02000887 | 6b7458e0 | 0200412f | 6c840018 | 6c3422bc | 000dad8c |
| 1463520 | 0000005c | 000d9c1c | b27cb66c | 0000052a | 7fffffff | 000d9d84 | 02000ce5 | 020031ed | 020031e5 | 000024ff | 02000885 | 000045df |
| 1463600 | 0000000c | 020031f5 | 0200412d | 00000010 | 00000014 | 02000885 | 0000000e | 0200412d | 00000012 | 00000016 | 00002aff | 28c40058 |
| 1463660 | 000d9dd8 | 5d100000 | 03003287 | 4b8c0000 | 000024ff | 60cc56f8 | 671c5370 | 581867b8 | 53705c30 | 020031f7 | 6530001c | 5e540000 |
| 1463740 | 0200412f | 66700018 | 5c9c001c | 02000887 | 6b7458e0 | 0200412f | 6c840018 | 6c3422bc | 000e0170 | 0000005c | 000d9cd0 | b27cb66c |
| 1464020 | 0000052b | 7fffffff | 000d9e38 | 02000ce5 | 020031ed | 020031e5 | 000024ff | 02000885 | 00004577 | 0000000c | 020031f5 | 0200412d |
| 1464100 | 00000010 | 00000014 | 02000885 | 0000000e | 0200412d | 00000012 | 00000016 | 00002aff | 28c40058 | 000d9e80 | 5d100000 | 03003287 |
| 1464160 | 4b8c0000 | 000024ff | 60cc56f8 | 671c5370 | 581867b8 | 53705c30 | 020031f7 | 6530001c | 5e540000 | 0200412f | 66700018 | 5c9c001c |
| 1464240 | 02000887 | 6b7458e0 | 0200412f | 6c840018 | 6c3422bc | 000dfa68 | 00000050 | 000d9d84 | b27cb66c | 0000052c | 7fffffff | 000d9edc |
| 1464320 | 02000ce5 | 020031ed | 020031e5 | 000024ff | 02003645 | 0000000c | 00000010 | 02000a3d | 0200412d | 00000014 | 0000000e | 010045c5 |
| 1464400 | 00000012 | 00002aff | 28c40054 | 000d9f18 | 5d100000 | 03003287 | 4b8c0000 | 000024ff | 64205819 | 67ec0020 | 537056f8 | 60cc5aec |
| 1464460 | 0200412f | 5fa0671c | 581867b8 | 53705c30 | 010045c7 | 67ec001c | 36a43724 | 00183678 | 00203614 | 001c22bc | 000cc5cc | 00000044 |
| 1464540 | 000d9e38 | b27cb66c | 0000052d | 7fffffff | 000d9f68 | 02000ce5 | 020031ed | 020031e5 | 000024ff | 02003765 | 0000000c | 00000010 |
| 1464620 | 0200412d | 00000014 | 0000000e | 00002aff | 29540048 | 0002438a | 5d100000 | 03003287 | 4b8c0000 | 000024ff | 64205818 | 67ec001c |
| 1464700 | 537056f8 | 671c5370 | 5d100000 | 0200412f | 5fa0671c | 36a43724 | 00183678 | 001c320c | 239c0000 | 000cf1c8 | 000000a0 | 000d9edc |
| 1464760 | b27cb66c | 0000052e | 7fffffff | 000dd3c0 | 02000ce5 | 020031ed | 020031e5 | 00004457 | 02000a3d | 02000885 | 000045e7 | 0000000c |
| 1465040 | 02000a3d | 01003705 | 00000010 | 02000a3d | 0000083f | 02000885 | 000045ef | 00000014 | 020031f5 | 0200412d | 00000018 | 020045f5 |
| 1465120 | 0000001c | 00000020 | 02000a3d | 02000885 | 0000000e | 0200412d | 0000001a | 0000001e | 02000885 | 00000016 | 0200412d | 0000001a |
| 1465200 | 00000022 | 00002aff | 000db4fc | 00000038 | b27cb66c | 0000052f | 0000055e | 000dd404 | 02000ce5 | 05001b0d | 00004457 | 0000001b |
| 1465260 | 00002c07 | 006d6c63 | 000002b3 | 00002aff | 2c7800c0 | 0002438a | 5d100000 | 03003287 | 4b8c0000 | 00004457 | 60cc56f8 | 671c55f0 |
| 1465340 | 686855f0 | 69b05370 | 581867b8 | 53705c30 | 020031f7 | 6530001c | 5e540000 | 0200412f | 67ec0018 | 5a180000 | 020045f7 | 66700020 |
| 1465420 | 5c9c001c | 02000a3f | 66c00024 | 001c5ec0 | 00000024 | 02000887 | 6b7458e0 | 0200412f | 6c840018 | 6c840020 | 5c9c001c | 02000887 |
| 1465500 | 6d3c58e0 | 0200412f | 6c840018 | 6c344768 | 3410001c | 24d00000 | 000e0224 | 0020344c | 3eec001c | 381831f0 | 24d00000 | 000daccc |
| 1465560 | 00182ecc | 386c3d30 | 24200000 | 000e0244 | 29540028 | 0002438a | 30502520 | 24d00000 | 00080d0c | 000c42ac | 00004777 | 00080d0c |
| 1465640 | 000c234c | 0007fd0c | 000eeba4 | 000da128 | 000edf64 | 00000000 | 000d7a5c | 03004367 | 00002c07 | 0000000c | 000da200 | 000da200 |
| 1465720 | 00010054 | 00000000 | 0007fa1c | 0300436f | 00002c07 | 0000000c | 000da19c | 000da19c | 00010054 | 00000000 | 2caca176 | 0002438a |
| 1466000 | 2ca0a17e | 00000000 | 00000001 | 000aed94 | 000aeee8 | 0002438a | 000d809c | 00046174 | 74720000 | 2cac02fb | 0002438a | 2ca0031b |
| 1466060 | 00000000 | 00000001 | 000af030 | 000af184 | 0002438a | 000d8098 | 0007fa5c | 0300437f | 00002c07 | 0000000c | 000dae6c | 000dae6c |
| 1466140 | 00010054 | 00000000 | 000d7b10 | 03004387 | 00002c07 | 0000000c | 000daeb0 | 000daeb0 | 00010054 | 00000000 | 2caca206 | 0002438a |
| 1466220 | 2ca0a20e | 00000000 | 00000001 | 000af3a4 | 000a5444 | 0002438a | 000da224 | 000d0070 | 00106d6f | 72655f65 | 6c736966 | 5f73746d |
| 1466300 | 7473003e | ffffffff | 0300438f | 00002c07 | 0000000c | 000da750 | 000da750 | 00010054 | 00000000 | ffffffff | 03004397 | 00002c07 |
| 1466360 | 0000000c | 000da800 | 000da800 | 00010054 | 00000000 | 0007fa9c | 0300439f | 00002c07 | 0000000c | 000da794 | 000da794 | 00010054 |
| 1466440 | 00000000 | ffffffff | 030043a7 | 00002c07 | 0000000c | 000da87c | 000da87c | 00010054 | 00000000 | 2aa8032b | 000da2d4 | 000afc40 |
| 1466520 | b464a2ce | 000afe3c | 000da314 | 2aa80373 | 000da380 | 000aff24 | 000e7365 | 6e736974 | 69766974 | 795f636c | 000da2f6 | 000c636f |
| 1466600 | 6e646974 | 696f6e5f | 636c0005 | 000a7469 | 63655f75 | 745f636c | 000da316 | b464031b | 000b0070 | 000da38c | ffffffff | 030043af |
| 1466660 | 00002c07 | 0000000c | 000db0bc | 000db0bc | 00010054 | 00000000 | ffffffff | 030043b7 | 00002c07 | 0000000c | 000db128 | 000db128 |
| 1466740 | 00010054 | 00000000 | ffffffff | 030043bf | 00002c07 | 0000000c | 000db194 | 000db194 | 00010054 | 00000000 | 2aa8a380 | 000da3b8 |
| 1467020 | 000b01f0 | b464a38c | 000b0434 | 000da3d8 | ffffffff | 030043c7 | 00002c07 | 0000000c | 000da9a0 | 000da9a0 | 00010054 | 00000000 |
| 1467100 | 2aa81b97 | 000da404 | 000b0569 | 000f6d6f | 72655f6e | 6578745f | 73746d74 | 73003147 | b46403f3 | 000b072c | 000da410 | 0007fabc |
| 1467160 | 030043cf | 00002c07 | 0000000c | 000daabc | 000daabc | 00010054 | 00000000 | 2aa8a40a | 000da41c | 000b0814 | b464033b | 000b0960 |
| 1467240 | 000da428 | 2aa8a422 | 000da434 | 000a3848 | b4640393 | 000a3a24 | 000da440 | 2aa8a43a | 000da44c | 000a3ac0 | b4640363 | 000a3b90 |
| 1467320 | 000da458 | 2aa8a452 | 000da464 | 000a3d68 | b4640323 | 000a40a4 | 000da488 | 2aa8a46a | 000da4d4 | 000a4224 | 00067461 | 72676574 |
| 1467400 | 0000017b | 00097661 | 72617373 | 69676e00 | b464031b | 000a4a70 | 000da4f8 | 0007fafc | 030043d7 | 00002c07 | 0000000c | 000da55c |
| 1467460 | 000da55c | 00010054 | 00000000 | ffffffff | 0400368f | 00002c07 | 00000010 | 000e5f9c | 000e5f9c | 0001005a | 00000000 | 2aa8a4da |
| 1467540 | 000da524 | 000a4d10 | 00087761 | 7665666f | 726d0083 | 00097369 | 67617373 | 69676e00 | b4642aff | 000a51b4 | 000da530 | ffffffff |

| | | | | | | | | | | | | |
|---|---|---|---|---|---|---|---|---|---|---|---|---|
| 1467620 | 030043f7 | 00002c07 | 0000000c | 000da62c | 000da62c | 00010054 | 00000000 | 2b240007 | 0002438a | 000a5454 | b4641d57 | 000a58c4 |
| 1467700 | 000da5b0 | 000046e7 | b1280000 | 000e49a0 | 00000000 | 000e02f0 | 000db244 | 000dfe84 | 0009ded8 | 2cac312f | 0002438a | 2ca00a57 |
| 1467760 | 00000000 | 00000001 | 000a594c | 000a594c | 0002438a | 000da580 | 000a5958 | 000e7761 | 7665666f | 726d5f65 | 6c6d6e74 | 000da594 |
| 1470040 | 00146d6f | 72655f77 | 61766566 | 6f726d5f | 656c6d6e | 747300ac | b464a5b0 | 000a59b0 | 000da654 | 03003287 | 29c8a5c0 | 000df92c |
| 1470120 | 000dc3ac | ffffffff | 0300441f | 00002c07 | 0000000c | 000da92c | 000da92c | 00010054 | 00000000 | ffffffff | 0300440f | 00002c07 |
| 1470200 | 0000000c | 000da660 | 000da660 | 00010054 | 00000000 | ffffffff | 03004417 | 00002c07 | 0000000c | 000da6d4 | 000da6d4 | 00010054 |
| 1470260 | 00000000 | 2cac2aff | 0002438a | 2ca00ce7 | 00000000 | 00000001 | 000a5a68 | 000a5a68 | 0002438a | 000da650 | 000a5a74 | b464a64a |
| 1470340 | 000a5b10 | 000da688 | 2cac0ce7 | 0002438a | 2ca02987 | 00000000 | 00000001 | 000a5b98 | 000a5c8c | 0002438a | 000da684 | 000da6a0 |
| 1470420 | b4642107 | 000a5bfc | 000da6b0 | 2b24001f | 0002438a | 000a5c9c | 03003287 | 29c82aff | 000da694 | 000a5ba8 | b4642aff | 000a5d58 |
| 1470500 | 000da6fc | 27f00010 | 000ed774 | 239c0000 | 000ed5c4 | 000ed718 | 000e8e80 | 2caca6c9 | 0002438a | 2ca00ce7 | 00000000 | 00000001 |
| 1470560 | 000a5e1c | 000a5f10 | 0002438a | 000da6f8 | 000da714 | b464001f | 000a5ee0 | 000da724 | 2b241d57 | 0002438a | 000a5f20 | 03003287 |
| 1470640 | 29c8434f | 000da708 | 000a5e2c | b464a72d | 000a5f4c | 000da778 | 03003287 | 29c8435f | 000db2f8 | 000dc030 | 0004756e | 69740000 |
| 1470720 | 000db184 | 00000000 | 2caca748 | 0002438a | 2ca0a740 | 00000000 | 00000001 | 000a5fd4 | 000a5fd4 | 0002438a | 000da774 | 000a5fe0 |
| 1471000 | b4642aff | 000a6038 | 000da7bc | 03003287 | 29c801db | 000e04ec | 000e3288 | 2cac095f | 0002438a | 2ca0001b | 00000000 | 00000001 |
| 1471060 | 000a6104 | 000a6220 | 0002438a | 000da7b8 | 000da7d4 | b464a7c2 | 000a6190 | 000da7e4 | 2b24039b | 0002438a | 000a6230 | 03003287 |
| 1471140 | 29c8017b | 000da7c8 | 000a6114 | b464a7ea | 000a631c | 000da828 | 000d6465 | 66696e69 | 74696f6e | 5f696e00 | 2cac039b | 0002438a |
| 1471220 | 2ca0017b | 00000000 | 00000001 | 000a6420 | 000a658c | 0002438a | 000da824 | 000da840 | b464032b | 000a655c | 000da860 | 2b24a83a |
| 1471300 | 0002438a | 000a659c | 03003287 | 29c8a84a | 000da834 | 000a6430 | 000a7061 | 72616d5f | 73706563 | 000da862 | b464017b | 000a65c8 |
| 1471360 | 000da8a4 | 03003287 | 29c8017b | 000db328 | 000dbd70 | 2caca882 | 0002438a | 2ca0a88a | 00000000 | 00000001 | 000a6664 | 000a44dc |
| 1471440 | 0002438a | 000da8a0 | 000da8bc | b464a8aa | 000a66f4 | 000da8e0 | 2b24036b | 0002438a | 000a44ec | 03003287 | 29c80373 | 000da8b0 |
| 1471520 | 000a6674 | 000e6469 | 73637265 | 74655f72 | 616e6765 | 000da8e2 | b46402fb | 000a456c | 000da964 | 000c696e | 745f7479 | 70655f64 |
| 1471600 | 65660000 | 000e8d10 | 00000000 | 000e8d90 | 000da8fc | 0007fb5c | 03004427 | 00002c07 | 0000000c | 000dfc8c | 000dfc8c | 00010056 |
| 1471660 | 00000000 | 2caca932 | 0002438a | 2ca0a93a | 00000000 | 00000001 | 000b0a38 | 000b0a38 | 0002438a | 000da950 | 000b0a44 | 000b7365 |
| 1471740 | 76657265 | 5f73746d | 7400039b | b464a96a | 000a4914 | 000da9c8 | 000046e7 | b328a97a | 000e4974 | 00000000 | 0007fb7c | 0300442f |
| 1472020 | 00002c07 | 0000000c | 000daa24 | 000daa24 | 00010054 | 00000000 | 2cac032b | 0002438a | 2ca0017b | 00000000 | 00000001 | 000a69c8 |
| 1472100 | 000a6bc8 | 0002438a | 000da9c4 | 000da9e0 | b464030b | 000a6a98 | 000da9f0 | 2aa8a9da | 000da9fc | 000a6b14 | 03003287 | 29c8a9ea |
| 1472160 | 000da9d4 | 000a69d8 | b46402fb | 000a6b98 | 000daa08 | 2b24aa02 | 0002438a | 000a6bd8 | b464032b | 000a6c04 | 000daa4c | 000d656e |
| 1472240 | 756d5f74 | 7970655f | 64656600 | 2caca7da | 0002438a | 2ca0aa32 | 00000000 | 00000001 | 000a6ca8 | 000a6d6c | 0002438a | 000daa48 |
| 1472320 | 000daa64 | b464aa52 | 000a6d3c | 000daa80 | 2b24037b | 0002438a | 000a6d7c | 03003287 | 29c8030b | 000daa58 | 000a6cb8 | 00097768 |
| 1472400 | 656e5f73 | 746d7400 | b464017b | 000a6da8 | 000daae4 | 03003287 | 29c8017b | 000e6ae0 | 000e3680 | ffffffff | 03004437 | 00002c07 |
| 1472460 | 0000000c | 000dab40 | 000dab40 | 00010054 | 00000000 | 2cacaac2 | 0002438a | 2ca0aaca | 00000000 | 00000001 | 000a6e48 | 000a6fd4 |
| 1472540 | 0002438a | 000daae0 | 000daafc | b464aaea | 000a6edc | 000dab0c | 2aa8034b | 000dab18 | 000a6f44 | 03003287 | 29c802fb | 000daaf0 |
| 1472620 | 000a6e58 | b464ab12 | 000a6fa4 | 000dab24 | 2b24032b | 0002438a | 000a6fe4 | b464ab2a | 000a7010 | 000dab68 | 000b7363 | 616c6172 |
| 1472700 | 5f747970 | 65000000 | 2cac039b | 0002438a | 2ca003a3 | 00000000 | 00000001 | 000a70ac | 000a716c | 0002438a | 000dab64 | 000dab80 |
| 1472760 | b4640173 | 000a713c | 000dab90 | 2b24ab7a | 0002438a | 000a717c | 03003287 | 29c8acba | 000dab74 | 000a70bc | b4640343 | 000a71a8 |
| 1473040 | 000dabd4 | 000d6174 | 74726962 | 75746573 | 2e706c00 | 2cacaba2 | 0002438a | 2ca0abaa | 00000000 | 00000001 | 000a7344 | 000a7344 |
| 1473120 | 0002438a | 000dabd0 | 000a7350 | b464abca | 000a74b0 | 000dac18 | 03003287 | 29c80000 | 000db34c | 000dbb00 | 2cac017b | 0002438a |
| 1473200 | 2ca0039b | 00000000 | 00000001 | 000a75cc | 000a75cc | 0002438a | 000dac14 | 000a75d8 | b464017b | 000a7738 | 000dac5c | 03003287 |
| 1473260 | 29c8032b | 000e6b2c | 000e380c | 2cacac2a | 0002438a | 2ca0ac32 | 00000000 | 00000001 | 000a7844 | 000a7a8c | 0002438a | 000dac58 |
| 1473340 | 000dac74 | b464ac52 | 000a7984 | 000dac98 | 2b24031b | 0002438a | 000a7a9c | 03003287 | 29c8032b | 000dac68 | 000a7854 | 00104c69 |
| 1473420 | 62726172 | 79207061 | 636b6167 | 6520008a | b464017b | 000a7c70 | 000dad40 | 000a6269 | 745f7665 | 63746f72 | 00000000 | 00046c69 |
| 1473500 | 6e650000 | ffffffff | 04003707 | 00002c07 | 00000010 | 000e6094 | 000e6094 | 0001005a | 00000000 | 2cacace2 | 0002438a | 2ca0acea |
| 1473560 | 00000000 | 00000001 | 000a7dd0 | 000a7dd0 | 0002438a | 000dad00 | 000a7ddc | 000e7365 | 6c656374 | 65645f6e | 616d6573 | 000dad1a |
| 1473640 | 000d7365 | 6c656374 | 65645f6e | 616d6500 | 00136d6f | 72655f73 | 656c6563 | 7465645f | 6e616d65 | 7300ad42 | b4640393 | 000a7fbc |
| 1473720 | 000dade4 | ffffffff | 0300444f | 00002c07 | 0000000c | 000dadbc | 000dadbc | 00010054 | 00000000 | 000b616e | 63657374 | 6f725f6f |
| 1474000 | 66000000 | ffffffff | 03004457 | 00002c07 | 0000000c | 000e0254 | 000e0254 | 00010056 | 00000000 | ffffffff | 0300445f | 00002c07 |
| 1474060 | 0000000c | 000dae00 | 000dae00 | 00010054 | 00000000 | 2cacadc2 | 0002438a | 2ca0adca | 00000000 | 00000001 | 000a806c | 000a806c |
| 1474140 | 0002438a | 000dade0 | 000a8071 | b464adea | 000a810c | 000dae28 | 000d636f | 6e637572 | 72656e74 | 2e706c00 | 2cac039b | 0002438a |
| 1474220 | 2ca0032b | 00000000 | 00000001 | 000a81c8 | 000a82b0 | 0002438a | 000dae24 | 000dae40 | b46403a3 | 000a8284 | 000dae50 | 2b24ae3a |
| 1474300 | 0002438a | 000a82c0 | 03003287 | 29c8ae4a | 000dae34 | 000a81d8 | b4640343 | 000a82ec | 000dae94 | 000044cf | b328031b | 000db498 |
| 1474360 | 00000000 | 2cacae72 | 0002438a | 2ca0ae7a | 00000000 | 00000001 | 000a83c0 | 000a83c0 | 0002438a | 000dae90 | 000a83cc | b464ae9a |
| 1474440 | 000a84b4 | 000daed8 | 03003287 | 29c8ae5c | 000db3c4 | 000d884c | 2cac032b | 0002438a | 2ca003c3 | 00000000 | 00000001 | 000a856c |
| 1474520 | 000a8648 | 0002438a | 000daed4 | 000daef0 | b4640113 | 000a8618 | 000daf1c | 2b24aeea | 0002438a | 000a8658 | 03003287 | 29c8aefa |
| 1474600 | 000daee4 | 000a857c | 00066364 | 6f696365 | 0000036b | 000c6d6f | 72655f63 | 686f6963 | 6573007b | b464af22 | 000a8684 | 000dafb0 |
| 1474660 | 000b7465 | 73747375 | 62747970 | 65000000 | 00023c3e | 00000000 | 000db0ac | 000cfd4c | ffffffff | 03004467 | 00002c07 | 0000000c |

| | | | | | | | | | | | | |
|---|---|---|---|---|---|---|---|---|---|---|---|---|
| 1474740 | 000dafdc | 000dafdc | 00010054 | 00000000 | ffffffff | 0300446f | 00002c07 | 0000000c | 000db054 | 000db054 | 00010054 | 00000000 |
| 1475020 | 2cac039b | 0002438a | 2ca0032b | 00000000 | 00000001 | 000a873c | 000a873c | 0002438a | 000dafac | 000a8748 | b46403a3 | 000a87e4 |
| 1475100 | 000db004 | 000a636f | 6e646974 | 696f6e73 | 00000000 | 000ed5e0 | 00000000 | 000ed620 | 00000000 | 2cacafe2 | 0002438a | 2ca0afea |
| 1475160 | 00000000 | 00000001 | 000a885c | 0009f288 | 0002438a | 000db000 | 000b0b60 | b464b00a | 000a88bc | 000a67bc | 2aa8034b | 000db01c |
| 1475240 | 000b0b24 | 2aa8b022 | 000db034 | 000a0d88 | b4640363 | 0009de6c | 000db040 | 2b24b03a | 0002438a | 0009f298 | b46403c3 | 000a8ac0 |
| 1475320 | 000db078 | 000ed6a0 | 000dafd4 | 2cacb05a | 0002438a | 2ca0b062 | 00000000 | 00000001 | 000a8c30 | 000a8ce0 | 0002438a | 0009f2e8 |
| 1475400 | b464b07e | 000a8cb0 | 000db0a0 | 2b240343 | 0002438a | 000a8cf0 | 03003287 | 29c8036b | 000db084 | 000a8c40 | b464b0a6 | 000a8d1c |
| 1475460 | 000db0e4 | 0000448f | b328b234 | 000d81e0 | 00000000 | 2cac030b | 0002438a | 2ca0039b | 00000000 | 00000001 | 000a8dbc | 000a8e80 |
| 1475540 | 0002438a | 000db0e0 | 000db0fc | b464017b | 000a8e50 | 000db10c | 2b24b0f6 | 0002438a | 000a8e90 | 03003287 | 29c8b106 | 000db0f0 |
| 1475620 | 000a8dcc | b464017b | 000a8ebc | 000db150 | 000044cf | b328ae5c | 000db4c4 | 00000000 | 2cacb12e | 0002438a | 2ca0b136 | 00000000 |
| 1475700 | 00000001 | 000a8f58 | 000a9018 | 0002438a | 000db14c | 000db168 | b464b156 | 000a8fe8 | 000db178 | 2b24031b | 0002438a | 000a9028 |
| 1475760 | 03003287 | 29c8032b | 000db15c | 000a8f68 | b464b17e | 000a9054 | 000db1bc | 02003767 | b328a6bc | 000e4de8 | 00000000 | 2cac0023 |
| 1476040 | 0002438a | 2ca0001f | 00000000 | 00000001 | 000a90f0 | 000a91b0 | 0002438a | 000db1b8 | 000db1d4 | b4642aff | 000a9180 | 000db228 |
| 1476120 | 2b242aff | 0002438a | 000a91c0 | 03003287 | 29c8000b | 000db1c8 | 000a9100 | 0100371f | b4640007 | 000a91ec | 000db21c | 000e8ef8 |
| 1476200 | 000db214 | 0000448f | b3292aff | 000d81b4 | 00000000 | 000eded0 | 00000000 | 000dff10 | 00000000 | b4640103 | 000a92b4 | 00000000 |
| 1476260 | b464b21e | 000a9338 | 000db278 | 000a636f | 6e637572 | 72656e74 | 00000000 | 000db1fc | 000cf978 | 000dfb9c | 000b86f0 | 2cac42d7 |
| 1476340 | 0002438a | 2ca00a57 | 00000000 | 00000001 | 000a93cc | 000a947c | 0002438a | 000d04d8 | b4642977 | 000a944c | 000db418 | 2b24b28a |
| 1476420 | 0002438a | 000a949c | 03003287 | 29c8b29a | 000db284 | 000a93dc | b4640000 | 000dc414 | 000df938 | b464b2a4 | 000dc318 | 000db2a0 |
| 1476500 | 000e6861 | 735f6475 | 706c6963 | 61746573 | 00091ec4 | 000d847c | 000d8304 | b464b2b0 | 000dc138 | 000db2ac | 0009656e | 756d5f6c |
| 1476560 | 69747300 | 0008656e | 756d5f6c | 697400f8 | 2b24b2f0 | 0002438a | 000dc0e4 | b464b2fc | 000dc084 | 000db2d4 | b464b308 | 000dbf98 |
| 1476640 | 000db304 | b464b314 | 000dbeac | 000db310 | 2b24b320 | 0002438a | 000dbe54 | b464b32c | 000dbdec | 000db31c | b464b338 | 000dbcc0 |
| 1476720 | 000db334 | 2b24b344 | 0002438a | 000dbc28 | b464b350 | 000dbba0 | 000db340 | b464b35c | 000dba38 | 000db358 | 00087465 | 73747479 |
| 1477000 | 70650000 | 00077479 | 70656465 | 6600b370 | b464b398 | 000db5cc | 000db3a0 | 00087479 | 70655f64 | 65660088 | b464b368 | 000db6ac |
| 1477060 | 000db364 | 2b24b3a4 | 0002438a | 000d8948 | b464b3b0 | 000d8904 | 000db398 | 2aa8b3bc | 000db3ac | 000d88bc | b464b3c8 | 000d8878 |
| 1477140 | 000db3b8 | b464b3d4 | 000d8748 | 000db3d0 | b464b3e0 | 000d8734 | 000db3dc | b464b3ec | 000d85d0 | 000db3e8 | b464b3f8 | 000d8358 |
| 1477220 | 000db3f4 | 00076f70 | 74696f6e | 7300b418 | b464b410 | 000d824c | 000db400 | 00087374 | 6d74732e | 706c0030 | 00272f68 | 6f6d652f |
| 1477300 | 6f736173 | 312f612f | 73726565 | 2f73656d | 616e7469 | 635f6368 | 65636b31 | 2f747970 | 65002aff | 002a2f68 | 6f6d652f | 6f736173 |
| 1477360 | 312f612f | 73726565 | 2f73656d | 616e7469 | 635f6368 | 65636b31 | 2f747970 | 652e706c | 0065636b | 0000002c | 000dd690 | b27cb66c |
| 1477440 | 000004e6 | 7fffffff | 000d81b0 | 02000ce5 | 0200293d | 000044cf | 000002b3 | 00002aff | 0000002c | 000dd6bc | b27cb66c | 00000542 |
| 1477520 | 7fffffff | 000d81dc | 02000ce5 | 02001f6d | 000044cf | 00002c07 | 00002aff | 00116d6f | 72655f61 | 73736f63 | 5f656c64 | 6e747300 |
| 1477600 | 000db618 | 000000c8 | b27cb66c | 000004e8 | 00000541 | 0009cbc1 | 02000ce5 | 02002385 | 000044cf | 00002c07 | 00002aff | 000db560 |
| 1477660 | 00000038 | b27cb66c | 000004e9 | 00000543 | 000db590 | 02000ce5 | 05001b0d | 000044d7 | 0000000b | 00002c07 | 006ead83 | 000002b3 |
| 1477740 | 00002aff | 000db58c | 0000002c | b4f0b4e4 | 000004e8 | 7fffffff | 0007eaad | 00000000 | 00000000 | 000a9e48 | 0002438a | 000e0648 |
| 1500020 | 000db618 | 00000038 | b27cb66c | 000004ea | 00000544 | 000db61c | 02000ce5 | 05001b0d | 000044e7 | 0000000b | 00002c07 | 006fb043 |
| 1500100 | 000002b3 | 00002aff | 00000054 | 000d8900 | b27cb66c | 000004eb | 7fffffff | 000db6a8 | 02000ce5 | 020031ed | 020031e5 | 00003ed7 |
| 1500160 | 02000885 | 000044f7 | 0000000c | 020031f5 | 01003ebd | 00000010 | 02000885 | 0000000e | 01003ebd | 00000012 | 00002aff | 000db7dc |
| 1500240 | 00000038 | b27cb66c | 000004ec | 00000545 | 000db7e0 | 02000ce5 | 05001b0d | 00003ed7 | 0000001b | 00002c07 | 00663823 | 000002b3 |
| 1500320 | 00002aff | 2c780054 | 0002438a | 5d100000 | 03003287 | 4b8c0000 | 00003ed7 | 60cc56f8 | 671c5370 | 581867b8 | 53705c30 | 020031f7 |
| 1500400 | 65300018 | 5e540000 | 01003ebf | 67b85ec0 | 00000018 | 02000887 | 6b7458e0 | 01003ebf | 6c3422bc | 000df628 | 00000138 | 000db5c8 |
| 1500460 | b27cb66c | 000004ed | 7fffffff | 000dba34 | 02000ce5 | 020031ed | 020031e5 | 000044f7 | 02000a3d | 02003645 | 0000352f | 0000000c |
| 1500540 | 02000a3d | 02003645 | 00000010 | 00000014 | 02000a3d | 02003645 | 0000226f | 00000018 | 02000a3d | 02000885 | 000044ff | 0000001c |
| 1500620 | 0100371d | 0000001a | 020031f5 | 01003ebd | 00000020 | 02000d0d | 02000a65 | 02000d0d | 02003bd5 | 02003ac5 | 00000024 | 0200352d |
| 1500700 | 00000012 | 00000028 | 00000022 | 02003bd5 | 02003ac5 | 0000002c | 0200350d | 00000012 | 00000030 | 00000022 | 02000a3d | 01002ced |
| 1500760 | 00004507 | 02000a3d | 01002ced | 00000012 | 02000a3d | 01002ced | 00003ad7 | 02000a3d | 01002ced | 00000016 | 00002527 | 02000a3d |
| 1501040 | 02000885 | 0000001e | 04004005 | 00000022 | 00000012 | 00000016 | 00000034 | 02000cdd | 00000022 | 01001b85 | 02003ac5 | 00000016 |
| 1501120 | 0200352d | 00000012 | 00000036 | 00002aff | 000dbabc | 00000038 | b27cb66c | 000004ee | 00000546 | 000dbac0 | 02000ce5 | 05001b0d |
| 1501200 | 000044f7 | 0000001b | 00002c07 | 006fb143 | 000002b3 | 00002aff | 2c78021c | 0002438a | 5d100000 | 03003287 | 4b8c0000 | 000044f7 |
| 1501260 | 60cc56f8 | 671c55f0 | 687c0034 | 55f06af0 | 032455f0 | 6af0001c | 55f06a00 | 53705818 | 67b95370 | 5e540000 | 020031f7 | 66700018 |
| 1501340 | 5c9c0018 | 01003ebf | 67ec0018 | 5e540000 | 02000d0f | 6670001c | 5c9c001c | 02000a67 | 66c00020 | 001c5ec0 | 00000020 | 02000d0f |
| 1501420 | 66c00024 | 00205ec0 | 00000024 | 02003bd7 | 67ec0024 | 6c840018 | 5c9c0024 | 02003ac7 | 5fa058e0 | 0200352f | 6af0002c | 5fa05ec0 |
| 1501500 | 00000020 | 02003bd7 | 67ec0020 | 6c840018 | 5c9c0020 | 02003ac7 | 5fa058e0 | 0200350f | 6e58002c | 5fa05ec0 | 0000001c | 02000a3f |
| 1501560 | 66c00020 | 001c5ec0 | 00000020 | 01002cef | 4b8c0000 | 00004507 | 5c9c001c | 02000a3f | 66c00020 | 001c5ec0 | 00000020 | 01002cef |
| 1501640 | 6e58002c | 5c9c001c | 02000a3f | 66c00020 | 001c5ec0 | 00000020 | 01002cef | 4b8c0000 | 00003ad7 | 5c9c001c | 02000a3f | 67ec001c |
| 1501720 | 4b8c0000 | 00002527 | 5c9c001c | 01002cef | 61f00030 | 5e540000 | 02000a3f | 6530001c | 5e540000 | 02000887 | 6e58001c | 5a180000 |
| 1502000 | 04004007 | 6c840018 | 6e58002c | 6e580030 | 67b85ec0 | 0000001c | 02000cdf | 6c840018 | 5a180000 | 01001b87 | 5a180000 | 02003ac7 |

```
1502060 6e580030 5a180000 0200352f 6e58002c 6c3436a4 477c3540 00180038 362c320c 41000000 0000352f 000cc5cc 003c3540
1502140 00180028 3f680038 38940034 382c0030 31f4002c 000cc5cc 002c3540 00180020 3f680028 38940024 331042ac 0000226f
1502220 000cc5cc 002433d8 3e700020 3af4001c 000df688 001c38e8 3d6c37f0 3cf4234c 000cc8c0 0000008c 000db6a8 b27cb66c
1502300 000004ef 7fffffff 000dbb9c 02000ce5 020031ed 020031e5 000044ff 02000885 0000450f 0000000c 020031f5 04004005
1502360 00000010 00000014 00000018 0000001c 02000a3d 02000885 0000000e 04004005 00000012 00000016 0000001a 0000001e
1502440 02000cdd 00000012 01001b85 02003ac5 0000001a 01004515 00000016 00002aff 000dbd2c 00000038 b27cb66c 000004f0
1502520 00000547 000dbd30 02000ce5 05001b04 000044ff 0000001b 00002c07 006fb443 000002b3 00002aff 27f000a4 000dbc18
1502600 51100000 03003287 4b8c0000 000044ff 60cc56f8 671c5370 581867b8 53705c30 020031f7 65300020 5e540000 04004007
1502660 6670001c 66c00018 00245ec0 00000020 02000a3f 66c00028 00205ec0 00000028 02000887 6b7458e0 04004007 6c84001c
1502740 6c346c84 00186c84 00245ec0 00000020 02000cdf 6c84001c 5a180000 01001b87 5a180000 02003ac7 6c840018 5a180000
1503020 01004517 6c3422bc 000df6ec 00000084 000dba34 b27cb66c 000004f1 7fffffff 000dbcbc 02000ce5 020031ed 020031e5
1503100 000044ff 02000885 0000451f 0000000c 020031f5 04004005 00000010 00000014 00000018 0000001c 02000a3d 02000885
1503160 0000000e 02004005 00000012 0000001e 02000cdd 00000012 01001b85 02003ac5 0000001a 01004525 00000016 00002aff
1503240 2954009c 0002438a 5d100000 03003287 4b8c0000 000044ff 60cc56f8 671c5370 581867b8 53705c30 020031f7 65300020
1503320 5e540000 04004007 6670001c 66c00018 00245ec0 00000020 02000a3f 66c00028 00205ec0 00000028 02000887 6b7458e0
1503400 02004007 6c84001c 6c840024 5c9c0020 02000cdf 6c84001c 5a180000 01001b87 5a180000 02003ac7 6c840018 5a180000
1503460 01004527 6c3422bc 000df74c 00000074 000dbb9c b27cb66c 000004f2 7fffffff 000dbde8 02000ce5 020031ed 020031e5
1503540 0000450f 02000885 0000452f 0000000c 020031f5 04004005 00000010 00000014 00000018 0000001c 02000a3d 02000885
1503620 0000000e 01004005 0000001e 03004535 00000016 0000001a 0000001e 00002aff 000dbf00 00000038 b27cb66c 000004f3
1503700 00000548 000dbf04 02000ce5 05001b0d 0000450f 0000001b 00002c07 006fb763 000002b3 00002aff 27f00080 000dbe44
1503760 51100000 03003287 4b8c0000 0000450f 60cc56f8 671c5370 581867b8 53705c30 020031f7 65300020 5e540000 04004007
1504040 5fa067ec 001c6670 00185ec0 00000020 02000a3f 66c00024 00205ec0 00000024 02000887 6b7458e0 01004007 6c345ec0
1504120 00000020 03004537 6c84001c 6c840018 6c3422bc 000df76c 00000064 000dbcbc b27cb66c 000004f4 7fffffff 000dbea8
1504200 02000ce5 020031ed 020031e5 0000450f 02000885 0000453f 0000000c 020031f5 04004005 00000010 00000014 00000018
1504260 0000001c 02000885 0000000e 02004005 00000012 0000001e 00002aff 2954005c 0002438a 5d100000 03003287 4b8c0000
1504340 0000450f 60cc56f8 671c5370 581867b8 53705c30 020031f7 6530001c 5e540000 04004007 67ec0018 5f8c67b8 5c9c001c
1504420 02000887 6b7458e0 02004007 6c840018 6c3422bc 000df7b4 0000005c 000dbde8 b27cb66c 000004f5 7fffffff 000dbf94
1504500 02000ce5 020031ed 020031e5 0000451f 02000885 00004547 0000000c 020031f5 02004005 00000010 00000014 02000885
1504560 0000000e 02004005 00000012 00000016 00002aff 000dbfec 00000038 b27cb66c 000004f6 00000549 000dbff0 02000ce5
1504640 05001b0d 0000451f 0000001b 00002c07 006fba63 000002b3 00002aff 2c780058 0002438a 5d100000 03003287 4b8c0000
1504720 0000451f 60cc56f8 671c5370 581867b8 53705c30 020031f7 6530001c 5e540000 02004007 66700018 5c9c001c 02000887
1505000 6b7458e0 02004007 6c840018 6c3422bc 000df7e8 0000005c 000dbea8 b27cb66c 000004f7 7fffffff 000dc080 02000ce5
1505060 020031ed 020031e5 00004547 02000885 0000454f 0000000c 020031f5 02004005 00000010 00000014 02000885 0000000e
1505140 02004005 00000012 00000016 00002aff 000dc1c8 00000038 b27cb66c 000004f8 0000054a 000dc1cc 02000ce5 05001b0d
1505220 00004547 0000001b 00002c07 006fbf43 000002b3 00002aff 27f00058 000dc0d4 5d100000 03003287 4b8c0000 00004547
1505300 60cc56f8 671c5370 581867b8 53705c30 020031f7 6530001c 5e540000 02004007 66700018 5c9c001c 02000887 6b7458e0
1505360 02004007 6c840018 6c3422bc 000df848 0000005c 000dbf94 b27cb66c 000004f9 7fffffff 000dc134 02000ce5 020031ed
1505440 020031e5 00004547 02000885 00004557 0000000c 020031f5 02004005 00000010 00000014 02000885 0000000e 02004005
1505520 00000012 00000016 00002aff 29540058 0002438a 5d100000 03003287 4b8c0000 00004547 60cc56f8 671c5370 581867b8
1505600 53705c30 020031f7 6530001c 5e540000 02004007 66700018 5c9c001c 02000887 6b7458e0 02004007 6c840018 6c3422bc
1505660 000df8ac 00000098 000dc080 b27cb66c 000004fa 7fffffff 000dc314 02000ce5 020031ed 020031e5 0000452f 02000a3d
1505740 010036d5 0000000c 02000a3d 02000885 0000455f 00000010 02000a3d 02000885 00004567 00000014 010036dd 00000018
1506020 020031f5 01004005 00000001 0000001c 00000020 02000a3d 02000885 00000012 01003ff5 0000001e 02000885 00000016
1506100 01004005 00000022 00002aff 000dc368 00000078 b27cb66c 000004fb 0000054b 000dc36c 02000ce5 05001b0d 0000452f
1506160 0000001b 00002c07 006fbb63 000002b3 00002aff 000dc368 00000040 00000000 000da7f0 00000000 000da6bc 00000000
1506240 000d7b00 000da784 000dafcd 000da905 000c920c 000da741 000d7d9c 000dab9c 000da6cd 2c7800d0 0002438a 5d100000
1506320 03003287 4b8c0000 0000452f 60cc56f8 671c55f0 687c0020 55f06aa0 55f069b0 53705818 67b85370 5e540000 020031f7
1506400 65300018 5e540000 01004007 55f05670 001c5ec0 00000018 02000a3f 66c00020 00185ec0 00000020 02000887 6e580020
1506460 5a180000 01003ff7 6c84001c 5c9c0018 02000887 6e0858e0 01004007 6c344768 34a00024 364035c8 31f0247c 000cf098
1506540 00283410 001c3e70 00243c9c 00000020 000df6cc 002033bc 3e70001c 3c480000 000df8cc 001838d4 3d6037dc 31f0234c
1506620 000cf0d8 00000058 000dc134 b27cb66c 000004fc 7fffffff 000dc410 02000ce5 020031ed 020031e5 0000455f 02003645
1506700 0000000c 00000010 020031f5 01003ff5 0000000e 0200040d 02003f35 0000000e 00000012 00002aff 00002aff 000dc528
1506760 00000038 b27cb66c 000004fd 0000054c 000dc52c 02000ce5 05001b0d 0000455f 0000001b 00002c07 006fb663 000002b3
1507040 00002aff 27f0006c 000dc44c 5d100000 03003287 4b8c0000 0000455f 64205818 67ec0020 537056f8 671c5370 5d100000
1507120 020031f7 60cc5aec 01003ff7 671c5c30 02000d0f 67b84af8 00002aff 5e540000 02003f37 6b7467ec 001c36a4 37240018
```

| | | | | | | | | | | | | |
|---|---|---|---|---|---|---|---|---|---|---|---|---|
| 1507200 | 36780020 | 3614001c | 239c0000 | 000cc5cc | 00000044 | 000dc314 | b27cb66c | 000004fe | 7fffffff | 000dc4a0 | 02000ce5 | 020031ed |
| 1507260 | 020031e5 | 0000455f | 02003755 | 0000000c | 00000010 | 01003ff5 | 0100433d | 0000000e | 00002aff | 2954004c | 0002438a | 5d100000 |
| 1507340 | 03003287 | 4b8c0000 | 0000455f | 64205818 | 67ec001c | 537056f8 | 671c5370 | 5d100000 | 01003ff7 | 5a180000 | 0100431f | 671c36a4 |
| 1507420 | 37240018 | 3678001c | 320c22bc | 000d803c | 0000008c | 000dc410 | b27cb66c | 000004ff | 7fffffff | 000dc610 | 02000ce5 | 020031ed |
| 1507500 | 020031e5 | 00004567 | 02000a3d | 0100413d | 0000000c | 02000a3d | 02000885 | 0000455f | 00000010 | 02000985 | 00004567 | 00000014 |
| 1507560 | 020031f5 | 01004005 | 00000001 | 00000018 | 0000001c | 02000a3d | 02000885 | 00000012 | 01003ff5 | 0000001a | 02000885 | 00000016 |
| 1507640 | 01004005 | 0000001e | 00002aff | 000dc6d0 | 00000038 | b27cb66c | 00000500 | 0000054d | 000dc6d4 | 02000ce5 | 05001b0d | 00004567 |
| 1507720 | 0000001b | 00002c07 | 006fc663 | 000002b3 | 00002aff | 27f000ac | 000dc640 | 5d100000 | 03003287 | 4b8c0000 | 00004567 | 60cc56f8 |
| 1510000 | 671c55f0 | 686855f0 | 69b05370 | 581867b8 | 53705c30 | 020031f7 | 65300018 | 5e540000 | 01004007 | 55f06670 | 001c5ec0 | 00000018 |
| 1510060 | 02000a3f | 66c00020 | 00185ec0 | 00000020 | 02000987 | 6e0858e0 | 01003ff7 | 6c84001c | 5c9c0018 | 02000487 | 6d3c58e0 | 01004007 |
| 1510140 | 6c344768 | 34a0001c | 364035c8 | 31f0247c | 000d0090 | 002033bc | 3e70001c | 3c480000 | 000df6cc | 0018386c | 3d302340 | 000df8cc |
| 1510220 | 00000038 | 000dc4a0 | b27cb66c | 00000501 | 7fffffff | 000dc678 | 02000ce5 | 020031ed | 020031e5 | 00004567 | 00000007 | 01004005 |
| 1510300 | 00000007 | 00002aff | 2954002e | 0002438a | 5d100000 | 03003287 | 4b8c0000 | 00004567 | 537055f0 | 671c5370 | 5d100000 | 01004007 |
| 1510360 | 53704960 | 228c0093 | 0000005c | 000dc610 | b27cb66c | 00000502 | 7fffffff | 000dc764 | 02000ce5 | 020031ed | 020031e5 | 0000453f |
| 1510440 | 02000885 | 0000456f | 0000000c | 020031f5 | 02004005 | 00000010 | 00000014 | 02000885 | 0000000e | 02004005 | 00000012 | 00000016 |
| 1510520 | 00002aff | 000dc7cc | 00000038 | b27cb66c | 00000503 | 0000054e | 000dc7d0 | 02000ce5 | 05001b0d | 0000453f | 0000001b | 00002c07 |
| 1510600 | 006fbda3 | 000002b3 | 00002aff | 2c780058 | 0002438a | 5d100000 | 03003287 | 4b8c0000 | 0000453f | 60cc56f8 | 671c5370 | 581867b8 |
| 1510660 | 53705c30 | 020031f7 | 6530001c | 5e540000 | 02004007 | 66700018 | 5c9c001c | 02000887 | 6b7458e0 | 02004007 | 6c840018 | 6c3422bc |
| 1510740 | 000df9b4 | 0000006c | 000dc678 | b27cb66c | 00000504 | 7fffffff | 000dc880 | 02000ce5 | 020031ed | 020031e5 | 0000456f | 02000a3d |
| 1511020 | 02003645 | 000034cf | 0000000c | 02000885 | 000034cf | 00000010 | 020031f5 | 02004005 | 00000014 | 00000018 | 02000885 | 00000012 |
| 1511100 | 02004005 | 00000016 | 0000001a | 00002aff | 000dc8dc | 00000038 | b27cb66c | 00000505 | 0000054f | 000dc8e0 | 02000ce5 | 05001b0d |
| 1511160 | 0000456f | 0000001b | 00002c07 | 006fcda3 | 000002b3 | 00002aff | 2c780078 | 0002438a | 5d100000 | 03003287 | 4b8c0000 | 0000456f |
| 1511240 | 60cc56f8 | 671c55f0 | 692c5370 | 581867b8 | 53705c30 | 020031f7 | 6530001c | 5e540000 | 02004007 | 66700018 | 5c9c001c | 02000887 |
| 1511320 | 6d3c58e0 | 02004007 | 6c840018 | 6c3436a4 | 476834e0 | 0018362c | 320c42ac | 000034cf | 000cc5cc | 0018386c | 3d302340 | 000dfa08 |
| 1511400 | 00000060 | 000dc764 | b27cb66c | 00000506 | 7fffffff | 000dc97c | 02000ce5 | 020031ed | 020031e5 | 000034cf | 02000985 | 00004577 |
| 1511460 | 0000000c | 020031f5 | 02004005 | 00000010 | 010034cd | 00000014 | 02000885 | 0000000e | 0200412d | 00000012 | 00000016 | 00002aff |
| 1511540 | 000dcc54 | 00000038 | b27cb66c | 00000507 | 00000550 | 000dcc58 | 02000ce5 | 05001b0d | 000034cf | 0000001b | 00002c07 | 006fd043 |
| 1511620 | 000002b3 | 00002aff | 27f00064 | 000dca6c | 5d100000 | 03003287 | 4b8c0000 | 000034cf | 60cc56f8 | 671c5370 | 581867b8 | 53705c30 |
| 1511700 | 020031f7 | 6530001c | 5e540000 | 02004007 | 67ec0018 | 5a180000 | 010034cf | 67b85ec0 | 0000001c | 02000887 | 6b7458e0 | 0200412f |
| 1511760 | 6c840018 | 6c3422bc | 000dfa68 | 000000f8 | 000dc880 | b27cb66c | 00000508 | 7fffffff | 000dcbe0 | 02000ce5 | 020031ed | 020031e5 |
| 1512040 | 000034cf | 02000a3d | 02000885 | 00003b27 | 0000000c | 02000885 | 0000457f | 00000010 | 020031f5 | 02004005 | 00000014 | 00000018 |
| 1512120 | 02000a3d | 02000885 | 0000000e | 02003ff5 | 00000016 | 0000001c | 02000a3d | 02000885 | 00000012 | 03003ff5 | 00000016 | 00000020 |
| 1512200 | 00000024 | 02000a3d | 0000083f | 02000a3d | 02003b45 | 0000001e | 00000028 | 02000a3d | 02003b45 | 00000026 | 0000002c | 02000d0d |
| 1512260 | 02000a65 | 02000d25 | 00000022 | 0000351f | 02000d25 | 0000001a | 010034cd | 0200351d | 0000002a | 0000002e | 02000d25 | 0000001a |
| 1512340 | 010034cd | 0200341d | 0000002a | 0000002e | 00002aff | 2954016c | 0002438a | 5d100000 | 03003287 | 4b8c0000 | 000034cf | 60cc56f8 |
| 1512420 | 671c55f0 | 682c5370 | 581867b8 | 53705c30 | 020031f7 | 65300018 | 5e540000 | 02004007 | 6530001c | 5c9c0018 | 02000a3f | 66c00018 |
| 1512500 | 00205ec0 | 00000018 | 02000887 | 6b7458e0 | 02003ff7 | 6c3467ec | 00185ec0 | 00000020 | 02000a3f | 66c00024 | 00205ec0 | 00000024 |
| 1512560 | 02000887 | 6d3c58e0 | 03003ff7 | 6c346670 | 00285ec0 | 00000020 | 02000a3f | 4b8c0000 | 0000083f | 5a180000 | 02000a3f | 66c00024 |
| 1512640 | 00205ec0 | 00000024 | 02003b47 | 6c840018 | 67ec0018 | 5c9c0020 | 02000a3f | 66c00024 | 00205ec0 | 00000024 | 02003b47 | 6c3467b8 |
| 1512720 | 5c9c0020 | 02000d0f | 66c00024 | 00205ec0 | 00000024 | 02000a67 | 66c0002c | 00245ec0 | 0000002c | 02000d27 | 6c840028 | 4b8c0000 |
| 1513000 | 0000351f | 5c9c0024 | 02000d27 | 6c84001c | 5a180000 | 010034cf | 5a180000 | 0200351f | 6c840018 | 6c345ec0 | 00000020 | 02000d27 |
| 1513060 | 6c84001c | 5a180000 | 010034cf | 5a180000 | 0200341f | 6c840018 | 6c344768 | 33bc247c | 000d7538 | 0018386c | 3d302340 | 000dfad0 |
| 1513140 | 00000078 | 000dc97c | b27cb66c | 00000509 | 7fffffff | 000dcd18 | 02000ce5 | 020031ed | 020031e5 | 0000457f | 02000a3d | 02003645 |
| 1513220 | 0000351f | 0000000c | 02000a31 | 0000083f | 02000885 | 00003b27 | 00000010 | 020031f5 | 03003ff5 | 00000014 | 0000351f | 00000018 |
| 1513300 | 02000885 | 00000012 | 02003ff5 | 00000016 | 0000001a | 00002aff | 000dcec0 | 00000038 | b27cb66c | 0000050a | 00000551 | 000dcec4 |
| 1513360 | 02000ce5 | 05001b0d | 0000457f | 0000001b | 00002c07 | 006fd683 | 000002b3 | 00002aff | 27f00088 | 000dcd88 | 5d100000 | 03003287 |
| 1513440 | 4b8c0000 | 0000457f | 60cc56f8 | 671c55f0 | 692c5370 | 581867b8 | 53705c30 | 020031f7 | 6530001c | 5e540000 | 03003ff7 | 67ec0018 |
| 1513520 | 4b8c0000 | 0000351f | 67b85ec0 | 0000001c | 02000887 | 6d3c58e0 | 02003ff7 | 6c840018 | 6c3436a4 | 476834e0 | 0018362c | 320c42ac |
| 1513600 | 0000351f | 000cc5cc | 00182ecc | 386c3d30 | 24200000 | 000d7538 | 00000078 | 000dcbe0 | b27cb66c | 0000050b | 7fffffff | 000dce18 |
| 1513660 | 02000ce5 | 020031ed | 020031e5 | 0000457f | 02000a3d | 02003645 | 0000341f | 0000000c | 02000a3d | 0000083f | 02000885 | 00003b27 |
| 1513740 | 00000010 | 020031f5 | 03003ff5 | 00000014 | 0000341f | 00000018 | 02000885 | 00000012 | 02003ff5 | 00000016 | 0000001a | 00002aff |
| 1514020 | 29540088 | 0002438a | 5d100000 | 03003287 | 4b8c0000 | 0000457f | 60cc56f8 | 671c55f0 | 682c5370 | 581867b8 | 53705c30 | 020031f7 |
| 1514100 | 6530001c | 5e540000 | 03003ff7 | 67ec0018 | 4b8c0000 | 0000341f | 67b85ec0 | 0000001c | 02000887 | 6d3c58e0 | 02003ff7 | 6c840018 |
| 1514160 | 6c3436a4 | 476834e0 | 0018362c | 320c42ac | 0000341f | 000cc5cc | 00182ecc | 386c3d30 | 24200000 | 000d7538 | 000000ac | 000dcd18 |
| 1514240 | b27cb66c | 0000050c | 7fffffff | 000dcfe8 | 02000ce5 | 020031ed | 020031e5 | 0000454f | 02000a3d | 02003645 | 000033c7 | 0000000c |

| | | | | | | | | | | | | |
|---|---|---|---|---|---|---|---|---|---|---|---|---|
| 1514320 | 02000a3d | 02000885 | 00004587 | 00000010 | 02000a3d | 02003645 | 00003497 | 00000014 | 02000885 | 00003c57 | 00000018 | 020031f5 |
| 1514400 | 02004005 | 0000001c | 02004581 | 00000020 | 00000024 | 02000a3d | 02000885 | 00C00012 | 02004005 | 0000001e | 00000022 | 02000885 |
| 1514460 | 0000001a | 02004005 | 0000001e | 00000026 | 00002aff | 000dd088 | 00000038 | b27cb66c | 0000050d | 00000552 | 000dd08c | 02000ce5 |
| 1514540 | 05001b0d | 0000454f | 0000001b | 00002c07 | 006fc243 | 000002b3 | 00002aff | 2c7800ec | 0002438a | 5d100000 | 03003287 | 4b8c0000 |
| 1514620 | 0000454f | 60cc56f8 | 671c55f0 | 687c0020 | 55f06aa0 | 55f069b0 | 53705818 | 67b85370 | 5e540000 | 020031f7 | 6530001c | 5e540000 |
| 1514700 | 02004007 | 67ec0018 | 5a180000 | 0200458f | 66700020 | 5c9c001c | 02000a3f | 66c00024 | 001c5ec0 | 00000024 | 02000887 | 6e580020 |
| 1514760 | 5a180000 | 02004007 | 6c840018 | 6c840020 | 5c9c001c | 02000887 | 6d3c58e0 | 02004007 | 6c840018 | 6c3436a4 | 47683540 | 00180024 |
| 1515040 | 362c320c | 43000000 | 000033c7 | 000cc5cc | 00283410 | 001c3e70 | 00243c9c | 00000020 | 000dfbbc | 002034e0 | 00183f68 | 001c3880 |
| 1515120 | 320c42ac | 00003497 | 000cc5cc | 0018386c | 34302340 | 000cfbb4 | 000000a4 | 000dce18 | b27cb66c | 0000050e | 7fffffff | 000dd220 |
| 1515200 | 02000ce5 | 020031ed | 020031e5 | 00004587 | 02000a3d | 010036d5 | 0000000c | 02000a3d | 02000885 | 00004427 | 00000010 | 02000a3d |
| 1515260 | 02000885 | 00004597 | 00000014 | 010036dd | 00000018 | 020031f5 | 02004005 | 0000001c | 00000001 | 00000020 | 00000024 | 02000a3d |
| 1515340 | 02000885 | 00000012 | 02004005 | 0000001e | 00000022 | 02000885 | 00000016 | 02004005 | 0000001e | 00000026 | 00002aff | 000dd278 |
| 1515420 | 000000b8 | b27cb66c | 0000050f | 00000553 | 000dd27c | 02000ce5 | 05001b0d | 00004587 | 0000001b | 00002c07 | 006fdde3 | 000002b3 |
| 1515500 | 00002aff | 000dd278 | 00000080 | 00000000 | 000da7f0 | 000dfc7c | 000da6bc | 00000000 | 000d7b00 | 000da784 | 000dfb9c | 000a60fd |
| 1515560 | 000dafd5 | 000da53c | 000d7d9c | 00000000 | 000dfb08 | 000dfc18 | 00000000 | 000dfce8 | 000dfe20 | 000dfe84 | 00000000 | 00000000 |
| 1515640 | 000e0048 | 00000000 | 000d7e2c | 000be0cd | 000da129 | 000da54d | 000e02f0 | 000dab9c | 000db04d | 2c7800dc | 0002438a | 5d100000 |
| 1515720 | 03003287 | 4b8c0000 | 00004587 | 60cc56f8 | 671c55f0 | 687c0020 | 55f06aa0 | 55f069b0 | 53705818 | 67b85370 | 5e540000 | 020031f7 |
| 1516000 | 6530001c | 5e540000 | 02004007 | 67ec0018 | 55f06670 | 00205ec0 | 0000001c | 02000a3f | 66c00024 | 001c5ec0 | 00000024 | 02000887 |
| 1516060 | 6e580020 | 5a180000 | 02004007 | 6c840018 | 6c840020 | 5c9c001c | 02000887 | 6e0858e0 | 02004007 | 6c840018 | 6c344768 | 34a00024 |
| 1516140 | 354035c8 | 31f0247c | 000cf098 | 00283410 | 001c3e70 | 00243c9c | 00000020 | 000da91c | 002033bc | 3e70001c | 3c480000 | 000dfc38 |
| 1516220 | 00183804 | 3d6037dc | 31f0234c | 000cf0d8 | 0000005c | 000dcfe8 | b27cb66c | 00000510 | 7fffffff | 000dd30c | 02000ce5 | 020031ed |
| 1516300 | 020031e5 | 00004427 | 02000885 | 000034cf | 0000000c | 020031f5 | 02004005 | 00000010 | 00000014 | 02000885 | 0000000e | 02004005 |
| 1516360 | 00000012 | 00000016 | 00002aff | 000dd400 | 00000038 | b27cb66c | 00000511 | 00000554 | 000d8a24 | 02000ce5 | 05001b0d | 00004427 |
| 1516440 | 0000001b | 00002c07 | 006d48e3 | 000002b3 | 00002aff | 27f00058 | 000dd360 | 5d100000 | 03003287 | 4b8c0000 | 00004427 | 60cc56f8 |
| 1516520 | 671c5370 | 581867b8 | 53705c30 | 020031f7 | 6530001c | 5e540000 | 02004007 | 66700018 | 5c9c001c | 02000887 | 6b7458e0 | 02004007 |
| 1516600 | 6c840018 | 6c3422bc | 000dfa08 | 0000005c | 000dd220 | b27cb66c | 00000512 | 7fffffff | 000d898c | 02000ce5 | 020031ed | 020031e5 |
| 1516660 | 00004427 | 02000885 | 00003c57 | 0000000c | 020031f5 | 02004005 | 00000010 | 00000014 | 02000885 | 0000000e | 02004005 | 00000012 |
| 1516740 | 00000016 | 00002aff | 29540058 | 0002438a | 5d100000 | 03003287 | 4b8c0000 | 00004427 | 60cc56f8 | 671c5370 | 581867b8 | 53705c30 |
| 1517020 | 020031f7 | 6530001c | 5e540000 | 02004007 | 66700018 | 5c9c001c | 02000887 | 6b7458e0 | 02004007 | 6c840018 | 6c3422bc | 000cfbb4 |
| 1517100 | 00000044 | 000d9f68 | b27cb66c | 00000530 | 7fffffff | 000a94f4 | 02000ce5 | 020031ed | 020031e5 | 000045e7 | 02003645 | 0000000c |
| 1517160 | 00000010 | 0200412d | 00000014 | 0000000e | 00002aff | 000dd5f4 | 00000038 | b27cb66c | 00000531 | 0000055f | 000a9714 | 02000ce5 |
| 1517240 | 05001b0d | 000045e7 | 0000001b | 00002c07 | 00701123 | 000002b3 | 00002aff | 000e02d4 | 001d636f | 6e646974 | 696f6e61 | 6c5f7369 |
| 1517320 | 676e616c | 5f617373 | 69676e6d | 656e7400 | ffffffff | 03004497 | 00002c07 | 0000000c | 000dd4f4 | 000dd4f4 | 00010055 | 00000000 |
| 1517400 | 2cacd46e | 0002438a | 2ca0d476 | 00000000 | 00000001 | 000d82f8 | 000d82f8 | 0002438a | 000db2d0 | 0015636f | 6e646974 | 696f6e61 |
| 1517460 | 6c5f7761 | 7665666f | 726d7300 | ffffffff | 0300449f | 00002c07 | 0000000c | 000dd5c0 | 000dd5c0 | 00010055 | 00000000 | 0007fbfc |
| 1517540 | 030044a7 | 00002c07 | 0000000c | 000dd550 | 000dd550 | 00010055 | 00000000 | 2cacd4fd | 0002438a | 2ca02a47 | 00000000 | 00000001 |
| 1517620 | 000d8470 | 000d8470 | 0002438a | 000db2cc | 00137768 | 656e5f65 | 6c73655f | 77617665 | 666f726d | 7300088f | 0007fc1c | 030044af |
| 1517700 | 00002c07 | 0000000c | 000dd578 | 000dd578 | 00010055 | 00000000 | 2cac000f | 0002438a | 2ca02037 | 00000000 | 00000001 | 000d8688 |
| 1517760 | 000d8688 | 0002438a | 000dd574 | 000d8694 | 2cac008f | 0002438a | 2ca02a47 | 00000000 | 00000001 | 000d879c | 000d879c | 0002438a |
| 1520040 | 000dd59c | 000d97a8 | ffffffff | 010044d7 | 00002c07 | 00000004 | 000a8b1c | 000a8b1c | 00010056 | 00000000 | 2cac000b | 0002438a |
| 1520120 | 2ca0008f | 00000000 | 00000001 | 000d883c | 000d8938 | 0002438a | 000dd5e4 | 000daea0 | 000db658 | 000db81c | 000dd6f8 | 0000002c |
| 1520200 | b288b66c | 00000564 | 7fffffff | 000da100 | 02000ce5 | 0100147d | 01002d65 | 0000000b | 00002aff | 002f2f68 | 6f6d652f | 6f736173 |
| 1520260 | 312f612f | 73726565 | 2f73656d | 616e7469 | 635f6368 | 65636b31 | 2f737562 | 70726f67 | 63616c6c | 73002c20 | 00322f68 | 6f6d652f |
| 1520340 | 6f736173 | 312f612f | 73726565 | 2f73656d | 616e7469 | 635f6368 | 65636b31 | 2f737562 | 70726f67 | 63616c6c | 732e706c | 0073656d |
| 1520420 | 0000002c | 000e06d4 | b27cb66c | 00000566 | 7fffffff | 000db494 | 02000ce5 | 0200293d | 00004617 | 000002bb | 00002aff | 0000002c |
| 1520500 | 000e0700 | b27cb66c | 0000057e | 7fffffff | 000db4c0 | 02000ce5 | 02001f6d | 00004617 | 00002c07 | 00002aff | 000f7375 | 6270726f |
| 1520560 | 6763616c | 6c732e70 | 6c000000 | 000dd7c0 | 0000002c | b27cb66c | 00000568 | 0000057d | 0009cbc1 | 02000ce5 | 02002385 | 00004617 |
| 1520640 | 00002c07 | 00002aff | 0000009c | 000aa024 | b27cb66c | 00000569 | 7fffffff | 000dd8f4 | 02000ce5 | 020031ed | 020031e5 | 0000430f |
| 1520720 | 02000a3d | 02003645 | 0000000c | 00000010 | 02000a3d | 01002d65 | 01003b6d | 0000000e | 02000a3d | 010036d5 | 00000014 | 02000a3d |
| 1521000 | 02000885 | 00004177 | 00000018 | 010036dd | 0000001c | 020031f5 | 02003ff5 | 00000020 | 0200461d | 0000000e | 00000024 | 02000885 |
| 1521060 | 0000001a | 02003ff5 | 00000022 | 00000026 | 00002aff | 000dda2c | 00000064 | b27cb66c | 0000056a | 0000057f | 000dda30 | 02000ce5 |
| 1521140 | 05001b0d | 0000430f | 0000001b | 00002c07 | 006be1e3 | 000002bb | 00002aff | 000dda2c | 0000002c | b4f0b4e4 | 00000569 | 7fffffff |
| 1521220 | 0007eaad | 00000000 | 00000000 | 000de334 | 0002438a | 000e2830 | 27f000cc | 000dd944 | 5d100000 | 03003287 | 4b8c0000 | 0000430f |
| 1521300 | 60cc56f8 | 671c55f0 | 687c0020 | 55f06aa0 | 55f069b0 | 53705818 | 67b85370 | 5e540000 | 020031f7 | 6530001c | 5e540000 | 02003ff7 |
| 1521360 | 67ec0018 | 5a180000 | 0200461f | 6af00028 | 67b85ec0 | 0000001c | 02000887 | 6e0858e0 | 02003ff7 | 6c840018 | 6c3436a4 | 47683540 |

| | | | | | | | | | | | | |
|---|---|---|---|---|---|---|---|---|---|---|---|---|
| 1521440 | 00180024 | 362c320c | 3af40024 | 000cc5cc | 002c3c9c | 00000028 | 000c8d18 | 002834a0 | 001c1eec | 0024182c | 002031f0 | 24d00000 |
| 1521520 | 000cf098 | 002033bc | 3e70001c | 3c480000 | 000d0590 | 001838d4 | 316037dc | 31f0234c | 000cf0d8 | 00000058 | 000dd728 | b27cb66c |
| 1521600 | 0000056b | 7fffffff | 000dd99c | 02000ce5 | 020031ed | 020031e5 | 0000430f | 02000a3d | 02003645 | 0000000c | 00000010 | 01002d65 |
| 1521660 | 01003b6d | 0000000e | 02003ff5 | 00000014 | 0100461d | 0000000e | 00002aff | 29540050 | 0002438a | 5d100000 | 03003287 | 4b8c0000 |
| 1521740 | 0000430f | 60cc56f8 | 671c5370 | 581867b8 | 53705c30 | 02003ff7 | 5fa058e0 | 0100461f | 682c36a4 | 37240018 | 362c320c | 3b4c0000 |
| 1522020 | 000cc5cc | 00102340 | 000c8d18 | 00000094 | 000d48f4 | b27cb66c | 0000056c | 7fffffff | 000ddb14 | 02000ce5 | 020031ed | 020031e5 |
| 1522100 | 00004177 | 02000a3d | 02000885 | 00004627 | 0000000c | 02000885 | 0000462f | 00000010 | 020031f5 | 02003ff5 | 00000014 | 00000001 |
| 1522160 | 00000018 | 0000001c | 02000a3d | 02000885 | 0000000e | 03003ff5 | 00000016 | 0000000b | 0000001a | 02000885 | 00000012 | 03003ff5 |
| 1522240 | 00000016 | 00000013 | 0000001e | 00002aff | 000d1bb0 | 00000038 | b27cb66c | 0000056d | 00000580 | 000ddbb4 | 02000ce5 | 05001b0d |
| 1522320 | 00004177 | 0000001b | 00002c07 | 00682c83 | 000002bb | 00002aff | 2c7800ac | 0002438a | 5d100000 | 03003287 | 4b8c0000 | 00004177 |
| 1522400 | 60cc56f8 | 671c55f0 | 682c5370 | 581867b8 | 53705c30 | 020031f7 | 6530001c | 5e540000 | 02003ff7 | 67ec0018 | 55f06670 | 00205ec0 |
| 1522460 | 0000001c | 02000a3f | 66c00024 | 001c5ec0 | 00000024 | 02000887 | 6b7458e0 | 03003ff7 | 6c840018 | 4b8c0000 | 0000000b | 6c840020 |
| 1522540 | 5c9c001c | 02000887 | 6d3c58e0 | 03003ff7 | 6c840018 | 4b8c0000 | 00000013 | 6c344768 | 33bc247c | 000e2678 | 0018386c | 3d302340 |
| 1522620 | 000e2698 | 000000a0 | 000dd99c | b27cb66c | 0000056e | 7fffffff | 000ddcac | 02000ce5 | 020031ed | 020031e5 | 00004627 | 02000a3d |
| 1522700 | 02000885 | 00004637 | 0000000c | 02000a3d | 0100367d | 00000010 | 02000885 | 0000463f | 00000014 | 020031f5 | 03003ff5 | 00000018 |
| 1522760 | 0000001c | 03003c8d | 0000001e | 00000020 | 00000024 | 02000a3d | 02000885 | 0000000e | 02003ff5 | 0000001a | 00000022 | 02000885 |
| 1523040 | 00000016 | 02003ff5 | 0000001a | 00000026 | 00002aff | 000dde38 | 00000038 | b27cb66c | 0000056f | 00000581 | 000dde3c | 02000ce5 |
| 1523120 | 05001b0d | 00004627 | 0000001b | 00002c07 | 007133c3 | 000002bb | 00002aff | 27f000c0 | 000dd10 | 5d100000 | 03003287 | 4b8c0000 |
| 1523200 | 00004627 | 60cc56f8 | 671c55f0 | 686855f0 | 69b05370 | 581867b8 | 53705c30 | 020031f7 | 6530001c | 5e540000 | 03003ff7 | 66700018 |
| 1523260 | 5a180000 | 03003c8f | 6c346670 | 00205ec0 | 0000001c | 02000a3f | 66c00024 | 001c5ec0 | 00000024 | 02000887 | 6b7458e0 | 02003ff7 |
| 1523340 | 6c840018 | 6c840020 | 5c9c001c | 02000987 | 6d3c58e0 | 02003ff7 | 6c840018 | 6c344768 | 3410001c | 24d00000 | 000e26dc | 0020344c |
| 1523420 | 3eec001c | 381831f0 | 24d00000 | 000d7e6c | 0018386c | 3d302340 | 000e26fc | 0000006c | 000ddb14 | b27cb66c | 00000570 | 7fffffff |
| 1523500 | 000ddd80 | 02000ce5 | 020031ed | 020031e5 | 00004627 | 02000885 | 0000463f | 0000000c | 020031f5 | 03003ff5 | 00000010 | 00000014 |
| 1523560 | 01003c8d | 00000016 | 00000007 | 00000018 | 02000885 | 0000000e | 02003ff5 | 00000012 | 0000001a | 00002aff | 29540068 | 0002438a |
| 1523640 | 5d100000 | 03003287 | 4b8c0000 | 00004627 | 60cc56f8 | 671c5370 | 581867b8 | 53705c30 | 020031f7 | 6530001c | 5e540000 | 03003ff7 |
| 1523720 | 66700018 | 5a180000 | 03003c8f | 6c345370 | 67b85ec0 | 0000001c | 02000887 | 6b7458e0 | 02003ff7 | 6c840018 | 6c3422bc | 000e26fc |
| 1524000 | 000000bc | 000ddcac | b27cb66c | 00000571 | 7fffffff | 000ddf64 | 02000ce5 | 020031ed | 020031e5 | 0000462f | 02000a3d | 0100413d |
| 1524060 | 0000000c | 02000a3d | 02000885 | 00004627 | 00000010 | 02000885 | 0000462f | 00000014 | 020031f5 | 03003ff5 | 00000018 | 0000001c |
| 1524140 | 00000001 | 00000020 | 00000024 | 02000a3d | 02000885 | 00000012 | 03003ff5 | 0000001a | 0000001e | 00000022 | 02000a3d | 0200226d |
| 1524220 | 00000028 | 02000a35 | 0000001e | 0000000b | 02000885 | 00000016 | 03003ff5 | 0000001a | 0000002a | 00000026 | 00002aff | 000de02c |
| 1524300 | 00000038 | b27cb66c | 00000572 | 00000582 | 000de030 | 02000ce5 | 05001b0d | 0000462f | 0000001b | 00002c07 | 007134c3 | 000002bb |
| 1524360 | 00002aff | 27f000f0 | 000ddf9c | 5d100000 | 03003287 | 4b8c0000 | 0000462f | 60cc56f8 | 671c55f0 | 686855f0 | 69b05370 | 581867b8 |
| 1524440 | 53705c30 | 020031f7 | 65300018 | 5e540000 | 03003ff7 | 66c0001c | 002455f0 | 66700020 | 5c9c0018 | 02000a3f | 66c00028 | 00185ec0 |
| 1524520 | 00000028 | 02000887 | 6e0858e0 | 03003ff7 | 6c84001c | 6c840024 | 6c840020 | 5c9c0018 | 02000a3f | 66c00018 | 00205ec0 | 00000018 |
| 1524600 | 0200226f | 67ec0018 | 5a180000 | 02000a37 | 6c840024 | 4b8c0000 | 0000000b | 5c9c0020 | 02000887 | 6d3c58e0 | 03003ff7 | 6c84001c |
| 1524660 | 6c840018 | 6c344768 | 34a0001c | 364035c8 | 31f0247c | 000d0090 | 002033bc | 3e70001c | 3c480000 | 000e2678 | 0018386c | 3d302340 |
| 1524740 | 000e2698 | 00000040 | 000dd80 | b27cb66c | 00000573 | 7fffffff | 000ddfd4 | 02000ce5 | 020031ed | 020031e5 | 0000462f | 00000007 |
| 1525020 | 03003ff5 | 0000000c | 00000010 | 00000007 | 00002aff | 29540030 | 0002438a | 5d100000 | 03003287 | 4b8c0000 | 0000462f | 537055f0 |
| 1525100 | 671c5370 | 5d100000 | 03003ff7 | 5f8c5370 | 4960228c | 0000005c | 000ddf64 | b27cb66c | 00000574 | 7fffffff | 000de0c0 | 02000ce5 |
| 1525160 | 020031ed | 020031e5 | 0000463f | 02000885 | 00004647 | 0000000c | 020031f5 | 02003ff5 | 00000010 | 00000014 | 02000885 | 0000000e |
| 1525240 | 02003ff5 | 00000012 | 00000016 | 00002aff | 000de118 | 00000038 | b27cb66c | 00000575 | 00000583 | 000de11c | 02000ce5 | 05001b0d |
| 1525320 | 0000463f | 0000001b | 00002c07 | 007137e3 | 000002bb | 00002aff | 2c780058 | 0002438a | 5d100000 | 03003287 | 4b8c0000 | 0000463f |
| 1525400 | 60cc56f8 | 671c5370 | 581867b8 | 53705c30 | 020031f7 | 6530001c | 5e540000 | 02003ff7 | 66700018 | 5c9c001c | 02000887 | 6b7458e0 |
| 1525460 | 02003ff7 | 6c840018 | 6c3422bc | 000e278c | 0000005c | 000ddfd4 | b27cb66c | 00000576 | 7fffffff | 000de1ac | 02000ce5 | 020031ed |
| 1525540 | 020031e5 | 00004647 | 02000885 | 000024ff | 0000000c | 020031f5 | 02003ff5 | 00000010 | 00000014 | 02000885 | 0000000e | 0200412d |
| 1525620 | 00000012 | 00000016 | 00002aff | 000de330 | 00000038 | b27cb66c | 00000577 | 00000584 | 000de334 | 02000ce5 | 05001b0d | 00004647 |
| 1525700 | 0000001b | 00002c07 | 00713c63 | 000002bb | 00002aff | 27f00058 | 000de200 | 5d100000 | 03003287 | 4b8c0000 | 00004647 | 60cc56f8 |
| 1525760 | 671c5370 | 581867b8 | 53705c30 | 020031f7 | 6530001c | 5e540000 | 02003ff7 | 66700018 | 5c9c001c | 02000887 | 6b7458e0 | 0200412f |
| 1526040 | 6c840018 | 6c3422bc | 000cfff0 | 0000005c | 000de0c0 | b27cb66c | 00000578 | 7fffffff | 000de260 | 02000ce5 | 020031ed | 020031e5 |
| 1526120 | 00004647 | 02000885 | 00003b3f | 0000000c | 020031f5 | 02003ff5 | 00000010 | 00000014 | 02000885 | 0000000e | 02003ff5 | 00000012 |
| 1526200 | 00000016 | 00002aff | 28c40058 | 000de29c | 5d100000 | 03003287 | 4b8c0000 | 00004647 | 60cc56f8 | 671c5370 | 581867b8 | 53705c30 |
| 1526260 | 020031f7 | 6530001c | 5e540000 | 02003ff7 | 66700018 | 5c9c001c | 02000887 | 6b7458e0 | 02003ff7 | 6c840018 | 6c3422bc | 000d72f4 |
| 1526340 | 00000044 | 000de1ac | b27cb66c | 00000579 | 7fffffff | 000de2f0 | 02000ce5 | 020031ed | 020031e5 | 00004647 | 02003645 | 0000265f |
| 1526420 | 0000000c | 02003ff5 | 00000010 | 0000265f | 00002aff | 2954004c | 0002438a | 5d100000 | 03003287 | 4b8c0000 | 00004647 | 60cc56f8 |
| 1526500 | 671c5370 | 581867b8 | 53705c30 | 02003ff7 | 5fa04af8 | 0000265f | 36a43724 | 0018362c | 320c41d4 | 0000265f | 239c0000 | 000cc5cc |

```
1526560 00000044 000de260 b27cb66c 0000057a 7fffffff 000e076c 02000ce5 020031ed 020031e5 00004637 02003645 0000000c
1526640 00000010 02003ff5 00000014 0000000e 00002aff 000de3b0 00000038 b130b66c 0000057b 000095a5 000dd7fd 02000ce5
1526720 05001b0d 00004637 0000001b 00002c07 007136e3 000002bb 00002aff 2c780048 0002438a 5d100000 03003287 4b8c0000
1527000 00004637 6420581a 67ec001c 537056f8 671c5370 5d100000 02003ff7 5fa0671c 36a43724 00183678 001c320c 239c0000
1527060 000cc5cc 000e0640 0000124c 5f76616c 75657328 5f2c5b5d 292e0a0a 756e636f 6e737472 61696e65 645f6172 7261795f
1527140 64656620 3c2d2d20 69642861 72726179 2c5f292c 206c7061 72656e74 68285f29 2c20696e 6465785f 73756274 7970655f
1527220 64656623 49646566 2c0a0909 09096d6f 72655f69 6e646578 5f737562 74797065 5f646566 73234d69 64656673 2c207270
1527300 6172656e 7468285f 292c2069 64286f66 2c5f292c 0a090909 09737562 74797065 5f696e64 69632353 690a0909 093c2d20
1527360 6c656761 6c5f7661 6c756573 284d6f64 756c652c 756e636f 6e737472 61696e65 645f6172 72617928 5b496465 66767c4d
1527440 69646566 73765d2c 53697629 290a0909 09092d3d 20496465 66236c65 67616c5f 76616c75 6573284d 6f64756c 652c4964
1527520 65667629 2c204d69 64656673 236c6567 616c5f76 616c7565 73284d6f 64756c65 2c4d6964 65667376 292c0a09 09090909
1527600 5369236c 6567616c 5f76616c 75657328 4d6f6475 6c652c53 6976292e 0a0a696e 6465785f 73756274 7970655f 64656620
1527660 3c2d2d20 74797065 5f6d6172 6b235464 2c206964 2872616e 67652c5f 292c2062 6f78285f 290a0909 093c2d20 6c656761
1527740 6c5f7661 6c756573 284d6f64 756c652c 546d7661 6c29202d 3d205464 236c6567 616c5f76 616c7565 73284d6f 64756c65
1530020 2c546d76 616c292e 0a0a6d6f 72655f69 6e646578 5f737562 74797065 5f646566 73203c2d 2d20636f 6d6d6131 285f292c
1530100 29696e64 65785f73 75627479 70655f64 65662349 6465662c 206d6f72 655f696e 6465785f 73756274 7970655f 64656673
1530160 234d6964 6566730a 0909093c 2d206c65 67616c5f 76616c75 6573294d 6f64756c 652c5b49 64656676 7c4d6964 65667376
1530240 5129202d 3d204964 6566236c 6567616c 5f76616c 75657328 4d6f6475 6c652c49 64656676 292c0a09 09090909 09094d69
1530320 64656673 236c6567 616c5f76 616c7565 73284d6f 64756c65 2c4d6964 65667376 292e0a6d 6f72655f 696e6465 785f7375
1530400 62747970 655f6465 6673203c 2d2d205b 5d203c2d 206c6567 616c5f76 616c7565 73285f2c 5b5d292e 0a0a7375 62747970
1530460 655f6465 636c203c 2d2d2069 64287375 62747970 652c5f29 2c206964 28492c4c 292c2069 64286973 2c5f292c 20737562
1530540 74797065 5f696e64 69632353 692c2073 656d6963 6f6c6f6e 284c290a 09093c2d 20636865 636b5f73 656d616e 74696373
1530620 284d6f64 756c6529 202d3d20 0a090909 2869735f 64656669 6e656428 7673285f 2c747970 6528492c 5f29292c 204d6f64
1530700 756c6529 3b206973 5f646566 696e6564 28767328 5f2c7375 62747970 6528492c 5f29292c 204d6f64 756c6529 29202d3e
1530760 200a0909 09090977 72697465 28274174 74656d70 7420746f 20726564 6566696e 65207375 62747970 65202729 2c207772
1531040 69746528 49292c20 0a090909 09097772 69746528 27206f6e 206c696e 65202729 2c207772 69746528 4c292c20 6e6c3b0a
1531120 20202020 20202020 20202020 20202020 20202020 20202020 20202020 20202020 20200953 69236c65 67616c5f 76616c75
1531200 6573284d 6f64756c 652c5369 76292c20 4d6f6475 6c653a61 73736572 747a2876 73284c2c 73756274 79706528 492c5369
1531260 76292929 2e0a0a73 75627479 70655f69 6e646963 203c2d2d 20747970 655f6d61 726b2354 6d2c2063 6f6e7374 7261696e
1531340 74234320 3c2d206c 6567616c 5f76616c 75657328 4d6f6475 6c652c73 75627479 70655f69 6e646963 28546d76 616c2c43
1531420 76616c29 29202d3d 200a0909 09090909 0909546d 236c6567 616c5f76 616c7565 73284d6f 64756c65 2c546d76 616c292c
1531500 0a090909 09090909 0943236c 6567616c 5f76616c 75657328 4d6f6475 6c652c43 76616c29 2e0a0909 09090909 09090a73
1531560 75627479 70655f69 6e646963 203c2d2d 20747970 655f6d61 726b2354 6d203c2d 206c6567 616c5f76 616c7565 73284d6f
1531640 64756c65 2c737562 74797065 5f696e64 69632854 6d76616c 2c5b5d29 29202d3d 20546d23 6c656761 6c5f7661 6c756573
1531720 284d6f64 756c652c 546d7661 6c292e0a 0a747970 655f6d61 726b203c 2d2d206e 616d6523 4e203c2d 206c6567 616c5f76
1532000 616c7565 73284d6f 64756c65 2c747970 655f6d61 726b2849 2c562929 202d3d20 4e23656e 636f6465 284d6f64 756c652c
1532060 49292c20 0a090909 09286973 5f646566 696e6564 28767328 5f2c7479 70652849 2c562929 2c204d6f 64756c65 293b0a09
1532140 09090909 09206973 5f646566 696e6564 28767328 5f2c7375 62747970 6528492c 5629292c 204d6f64 756c6529 3b0a0909
1532220 094e236c 696e6528 4c292c20 77726974 65282755 6e646566 696e6564 20747970 65202729 2c207772 69746528 49292c20
1532300 77726974 65282720 6f6e206c 696e6520 27292c20 77726974 65284c29 2c206e6c 292e0a0a 636f6e73 74726169 6e74203c
1532360 2d2d2072 616e6765 5f636f6e 73747261 696e7423 5263203c 2d206c65 67616c5f 76616c75 65732843 6f64756c 652c5263
1532440 636f6465 29202d3d 20526323 6c656761 6c5f7661 6c756573 284d6f64 756c652c 5263636f 6465292e 0a636f6e 73747261
1532520 696e7420 3c2d2d20 696e6465 785f636f 6e737472 61696e74 23496320 3c2d206c 6567616c 5f76616c 75657328 4d6f6475
1532600 6c652c49 63636f64 65292023 3d204963 236c6567 616c5f76 616c7565 73284d6f 64756c65 2c496363 6f646529 2e0a0a6e
1532660 616d6520 3c2d2d20 696e6465 7865645f 6e616d65 23536e20 3c2d2065 6e636f64 65284d6f 64756c65 2c536e63 6f646529
1532740 202d3d20 536e2365 6e636f64 65284d6f 64756c65 2c536e63 6f646529 2e0a6e61 6d65203c 2d2d2073 656c6563 7465645f
1533020 6e616d65 23536e20 3c2d2065 6e636f64 65284d6f 64756c65 2c536e63 6f646529 202d3d20 536e2365 6e636f64 65284d6f
1533100 64756c65 2c536e63 6f646529 2e0a6e61 6165203c 2d2d2073 6c696365 5f6e616d 6523536e 203c2d20 656e636f 6465284d
1533160 6f64756c 652c536e 636f6465 29202d3d 20536e23 656e636f 6465284d 6f64756c 652c536e 636f6465 292e0a6e 616d6520
1533240 3c2d2d20 61747472 5f6e616d 6523536e 203c2d20 656e636f 6465284d 6f64756c 652c536e 636f6465 29202d3d 20536e23
1533320 656e636f 6465284d 6f64756c 652c536e 636f6465 292e0a6e 616d6520 3c2d2d20 69642849 2c4c2920 3c2d2065 6e636f64
1533400 65285f2c 49292c20 6c696e65 284c292e 0a6e616d 65203c2d 2d207374 725f6c69 7428532c 5f29203c 2d20656e 636f6465
1533460 285f2c53 292e0a0a 73656c65 63746564 5f6e616d 65203c2d 2d207072 65666978 23502c20 706f696e 74285f29 2c20212c
1533540 20737566 66697823 530a0909 3c2d2065 6e636f64 65284d6f 64756c65 2c73656c 65637465 64285063 6f64652c 53636f64
1533620 65292920 2d3d2050 23656e63 6f646528 4d6f6475 6c652c50 636f6465 292c2053 23656e63 6f646528 4d6f6475 6c652c53
```

```
1533700 636f6465 292e0a0a 70726566 6978203c 2d2d2069 6428492c 5f29203c 2d20656e 636f6465 285f2c49 292e2001 2f2a2070
1533760 72656669 78203c2d 2d20666e 63616c6c 2346203c 2d20656e 636f6465 2846636f 64652920 2d3d2046 23656e63 6f646528
1534040 46636f64 65292e20 2a2f0a70 72656669 78203c2d 2d206964 28492c5f 292c206c 70617265 6e746828 5f292c20 65787072
1534120 23452c20 6d6f7265 5f657870 72732345 732c2072 70617265 6e746828 5f290a09 20203c2d 20656e63 6f646528 4d6f6475
1534200 6c652c69 6e646578 65642849 2c5b4576 616c7c45 7376616c 5d292920 2d3d2045 2376616c 7565284d 6f64756c 652c4576
1534260 616c292c 20457323 76616c75 65284d6f 64756c65 2c457376 616c292e 0a0a7375 66666978 203c2d2d 2073656c 65637465
1534340 645f6e61 6d652353 203c2d20 656e636f 6465284d 6f64756c 652c5363 6f646529 202d3d20 5323656e 636f6465 284d6f64
1534420 756c652c 53636f64 65292e0a 73756666 6978203c 2d2d2069 6428492c 5f29203c 2d20656e 636f6465 285f2c49 292e0a73
1534500 75666669 78203c2d 2d206369 61725f6c 69742843 2c5f2920 3c2d2065 6e636f64 65285f2c 43292e0a 73756666 6978203c
1534560 2d2d2073 74725f6c 69742853 2c5f2920 3c2d2065 6e636f64 65285f2c 53292e0a 73756666 6978203c 2d2d2069 6428616c
1534640 6c2c5f29 203c2d20 656e636f 6465285f 2c616c6c 292e0a0a 696e6465 7865645f 6e616d65 203c2d2d 20707265 66697823
1534720 502c206c 70617265 6e746828 5f292c20 65787072 23452c20 6d6f7265 5f657870 72732345 732c2072 70617265 6e746828
1535000 5f290a09 093c2d20 656e636f 6465284d 6f64756c 652c696e 64657865 64285063 6f64652c 5b457661 6c7c4573 76616c5d
1535060 29290a09 092d3d20 5023656e 636f6465 284d6f64 756c652c 50636f64 65292c20 45237661 6c756528 4d6f6475 6c652c45
1535140 76616c29 2c204573 2376616c 7565284d 6f64756c 652c4573 76616c29 2e0a736c 6963655f 6e616d65 203c2d2d 20707265
1535220 66697823 502c206c 70617265 6e746828 5f292c20 64697363 72657465 5f72616e 67652344 722c2072 70617265 6e746828
1535300 5f290a09 093c2d20 656e636f 6465284d 6f64756c 652c736c 69636528 50636f64 652c4472 76616c29 29202d3d 20502365
1535360 6e636f64 65284d6f 64756c65 2c50636f 6465292c 20447223 6c656761 6c5f7661 6c756573 284d6f64 756c652c 44727661
1535440 6c292e0a 61747472 5f6e6163 65203c2d 2d207072 65666978 23502c20 61706f73 74726f70 6865285f 292c2069 6428492c
1535520 5f290a09 093c2d20 656e636f 6465284d 6f64756c 652c6174 74722850 636f6465 2c492c5b 5d292920 2d3d2050 23656e63
1535600 6f646528 4d6f6475 6c652c50 636f6465 292e0a61 7474725f 6e616d65 203c2d2d 20707265 66697823 502c2061 706f7374
1535660 726f7068 65285f29 2c206964 28492c5f 292c206c 70617265 6e746828 5f292c20 65787072 23452c20 72706172 656e7468
1535740 285f290a 09093c2d 20656e63 6f646528 4d6f6475 6c652c61 74747228 50636f64 652c492c 45636f64 65292920 2d3d2050
1536020 23656e63 6f646528 4d6f6475 6c652c50 636f6465 292c2045 2376616c 7565284d 6f64756c 652c4563 6f646529 2e0a0aa1
1536100 0300260f 000dd2ec 000de131 000dd2f4 02000d27 000dd2d1 000df1b9 02000a57 000df18c 000df1c9 00002bd7 000df1ed
1536160 00000007 02000a57 000dd37d 000dc5c5 000df201 000df1e6 02000a57 000dd3a9 000dd1b1 000df215 000df1fa 02000a57
1536240 000dd3cd 000dd0c1 000df229 000df20e 02000a57 000dd3ed 000dc629 000df23d 000df222 02000a57 000dd40d 000dc609
1536320 000df251 000df236 02000a57 000dd42d 000dd0e9 000df265 000df24a 02000a57 000dd44d 000dd17d 000df279 000df25e
1536400 02000a57 000dd471 000dd151 000df28d 000df272 02000a57 000dd491 000dd131 000df2a1 000df286 02000a57 000dd4b1
1536460 000dc651 000df2b5 000df29a 02000a57 000dd4d1 000dc6e5 000df2c9 000df2ae 02000a57 000dd4f5 000dc6b9 000df2dd
1536540 000df2c2 02000a57 000dd515 000dc699 000df2f1 000df2d6 02000a57 000dd535 000dc70d 000df305 000df2ea 02000a57
1536620 000dd555 000dcffd 000df319 000df2fe 02000a57 000dd579 000dc775 000df32d 000df312 02000a57 000dd599 000dc755
1536700 000df341 000df326 02000a57 000dd5b9 000dd025 000df355 000df33a 02000a57 000dd5d9 000dd08d 000df369 000df34e
1536760 02000a57 000dd5fd 000dd06d 000df37d 000df362 02000a57 000dd61d 000dc79d 000df391 000df376 02000a57 000dd63d
1537040 000dcd85 000df3a5 000df38a 02000a57 000dd661 000dc805 000df3b9 000df39e 02000a57 000dd681 000dc7e5 000df3cd
1537120 000df3b2 02000a57 000dd6a1 000dcdad 000df3e1 000df3c6 02000a57 000dd6c1 000dcf0d 000df3f5 000df3da 02000a57
1537200 000dd6e5 000dce15 000df409 000df3ee 02000a57 000dd705 000dcdf5 000df41d 000df402 02000a57 000dd725 000dcf35
1537260 000df431 000df416 02000a57 000dd745 000dcfc9 000df445 000df42a 02000a57 000dd769 000dcf9d 000df459 000df43e
1537340 02000a57 000dd789 000dcf7d 000df46d 000df452 02000a57 000dd7a9 000dce3d 000df481 000df466 02000a57 000dd7c9
1537420 000dced9 000df495 000df47a 02000a57 000dd7ed 000dcea5 000df4a9 000df48e 02000a57 000dd80d 000dce85 000df4bd
1537500 000df4a2 02000a57 000dd82d 000dc82d 000df4d1 000df4b6 02000a57 000dd84d 000dcb0d 000df4e5 000df4ca 02000a57
1537560 000dd871 000dc895 000df4f9 000df4de 02000a57 000dd891 000dc875 000df50d 000df4f2 02000a57 000dd8b1 000dcb35
1537640 000df521 000df506 02000a57 000dd8d1 000dcc95 000df535 000df51a 02000a57 000dd8f5 000dcb9d 000df549 000df52e
1537720 02000a57 000dd915 000dcb7d 000df55d 000df542 02000a57 000dd935 000dccbd 000df571 000df556 02000a57 000dd955
1540000 000dcd51 000df585 000df56a 02000a57 000dd979 000dcd25 000df599 000df57e 02000a57 000dd999 000dcd05 000df5ad
1540060 000df592 02000a57 000dd9b9 000dcbc5 000df5c1 000df5a6 02000a57 000dd9d9 000dcc61 000df5d5 000df5ba 02000a57
1540140 000dd9fd 000dcc2d 000df5e9 000df5ce 02000a57 000dda1d 000dcc0d 000df5fd 0007fc7c 010044e7 00002c07 00000004
1540220 000c6310 000c6310 00010056 00000000 ffffffff 030044f7 00002c07 0000000c 000df698 000df698 00010056 00000000
1540300 2cac0a57 0002438a 2ca0c905 00000000 00000001 000db64c 000db64c 0002438a 000dd5e8 00194174 74656d70 7420746f
1540360 20726564 6566696e 65207479 70652000 000cffe0 030044ff 00002c07 0000000c 000df6fc 000df6fc 00010056 00000000
1540440 2cacf682 0002438a 2ca0db45 00000000 00000001 000db810 000db810 0002438a 000dd5ec 0007fd3c 0300455f 00002c07
1540520 0000000c 000df904 000df904 00010056 00000000 ffffffff 0300450f 00002c07 0000000c 000df77c 000df77c 00010056
1540600 00000000 2cacf6e6 0002438a 2ca0dbf5 00000000 00000001 000dbaf0 000dbc18 0002438a 000df720 000dabe0 0012636f
1540660 6d706f73 6974655f 74797065 5f646566 000df722 ffffffff 0300451f 00002c07 0000000c 000df7f8 000df7f8 00010056
1540740 00000000 ffffffff 0300452f 00002c07 0000000c 000df8dc 000df8dc 00010056 00000000 2cacdcd5 0002438a 2ca0f78d
```

```
1541020  00000000 00000001 000db460 000dbe44 0002438a 000df7a0 000da86c ffffffff 0300453f 00002c07 0000000c 000df9c4
1541100  000df9c4 00010056 00000000 000e6172 7261795f 74797065 5f646566 0000003b ffffffff 03004547 00002c07 0000000c
1541160  000df858 000df858 00010056 00000000 2cacf7fd 0002438a 2ca00043 00000000 00000001 000dbf34 000dbf34 0002438a
1541240  000df81c 000dbf40 0015636f 6e737472 61696e65 645f6172 7261795f 64656600 ffffffff 0300454f 00002c07 0000000c
1541320  000dfbcc 000dfbcc 00010056 00000000 2cacfffb 0002438a 2ca0166f 00000000 00000001 000dc020 000dc0d4 0002438a
1541400  000df87c 000da730 0017756e 636f6e73 74726169 6e65645f 61727261 795f6465 6600fffb ffffffff 03004557 00002c07
1541460  0000000c 000dfdec 000dfdec 00010056 00000000 0007fd5c 03004567 00002c07 0000000c 000df944 000df944 00010056
1541540  00000000 2cac0003 0002438a 2ca0fffb 00000000 00000001 000dc23c 000dc23c 0002438a 000df900 000dc248 2cac0013
1541620  0002438a 2ca00013 00000000 00000001 000dc39c 000dc44c 0002439a 000df924 000da5bc 2b24fffb 0002438a 000dc45c
1541700  b464fffb 000dc4a4 000df96c 2cacfffb 0002438a 2ca02647 00000000 00000001 000dc55c 000dc640 0002438a 000df968
1541760  000c8af0 b4640033 000dc614 000df998 2b24f97d 0002438a 000dc650 00107261 6e67655f 636f6e73 74726169 6e7400fb
1542040  b4640003 000dc67c 000df9ec 0007fd7c 0300456f 00002c07 0000000c 000dfa18 000dfa18 00010056 00000000 2cac166f
1542120  0002439a 2ca00003 00000000 00000001 000dc704 000dc704 0002438a 000df9e8 000dc710 b4642647 000dc768 000dfa4c
1542200  000bdb08 030034cf 00002c07 0000000c 000dfa78 000dfa78 00010056 00000000 2cacfa1d 0002438a 2ca00043 00000000
1542260  00000001 000dc800 000dc800 0002438a 000dfa3c 000dc80c 00096174 74725f6e 616d6500 b464166f 000dc884 000dfab4
1542340  0007fd9c 03004577 00002c07 0000000c 000e943c 000e043c 00010056 00000000 2cac2647 0002438a 2ca0000b 00000000
1542420  00000001 000dc910 000dca6c 0002438a 000dfa9c 000dfaec 000e746f 5f73696d 706c655f 65787072 00002647 b464002b
1542500  000dc980 000dfafc 0007fdbc 0300457f 00002c07 0000000c 000dfb18 000dfb18 00010056 00000000 2b24000b 0002438a
1542560  000dca7c 03003287 29c80a57 000dfae0 000dc920 b464000b 000dcbe4 000dfb40 000b656e 74697479 5f737065 63000000
1542640  2cac2647 0002438a 2ca0166f 00000000 00000001 000dcc88 000dcd88 0002438a 000dfb3c 000dfb58 b464000b 000dcd1c
1542720  000dfb90 2b240023 0002438a 000dcd98 03003287 29c8fb52 000dfb4c 000dcc98 0010696e 6465785f 636f6e73 74726169
1543000  6e740041 0011636f 6e737472 61696e65 645f6172 72617900 b464d4a5 000dce1c 000dfc0c 0000465f b328d4e9 000e06d8
1543060  00000000 ffffffff 03004587 00002c07 0000000c 000dfc48 000dfc48 00010056 00000000 2cacfbc2 0002438a 2ca0fbca
1543140  00000000 00000001 000dcef4 000dcef4 0002438a 000dfbf0 000dcf00 00146d6f 72655f64 69736372 6574655f 72616e67
1543220  65730095 b464fc02 000dcfec 000dfc70 03003287 29c8fc12 000e057c 000de15c 000b7654 03004597 00002c07 0000000c
1543300  000dfcf8 000dfcf8 00010056 00000000 2cacd79d 0002438a 2ca0d7bd 00000000 00000001 000dd13c 000dd13c 0002438a
1543360  000dfc6c 000dd148 b464d841 000dd224 000dfcb4 0000468f b328d885 000e28f8 00000000 2cacfc82 0002438a 2ca0fc8a
1543440  00000000 00000001 000dd2ac 000dd360 0002438a 000dfcb0 000dfccc b464fcaa 000dd310 000dfcdc 2b24d98d 0002438a
1543520  000dd370 03003287 29c849cd 000dfcc0 000dd2bc b464fcd2 000d8990 000dfd20 03003287 29c8fce2 000e05ac 000dde7c
1543600  2cacda75 0002438a 2ca0da95 00000000 00000001 000d8a54 000d8b48 0002438a 000dfd1c 000dfd38 b464db19 000d8b18
1543660  000dfd90 2b24fd22 0002438a 000d8b58 03003287 29c8fd32 000dfd2c 000d8a64 0011696e 6465785f 73756274 7970655f
1543740  64656600 00176d6f 72655f69 6e646578 5f737562 74797065 5f646566 7300fd6a 0013756e 636f6e73 74726169 6e65645f
1544020  61727261 7900fd82 b464dd11 000d8b84 000dfe14 000a6174 74726962 75746573 00000000 000b7684 0300459f 00002c07
1544100  0000000c 000dfe50 000dfe50 00010056 00000000 000c2378 030045a7 00002c07 0000000c 000dfe94 000dfe94 00010056
1544160  00000000 2cacfde2 0002438a 2ca0fdea 00000000 00000001 000d8ca4 000d8ca4 0002438a 000dfe10 000d8cb0 b464fe0a
1544240  000d8e28 000dfe78 03003287 29c8fe1a 000e05d0 000ddbf4 ffffffff 040036b7 00002c07 00000010 000e6284 000e6284
1544320  0001005a 00000000 2cacda75 0002438a 2ca0da51 00000000 00000001 000d8ecc 000d8ecc 0002438a 000dfe74 000d8ed8
1544400  b464d9cd 000d8f68 000dfebc 0000465f b328a555 000e0704 00000000 2cacfe8a 0002438a 2ca0fe92 00000000 00000001
1544460  000d902c 000d9120 0002438a 000dfeb8 000dfed4 b464feb2 000d90f0 000dff04 2b24d885 0002438a 000d9130 03003287
1544540  29c8d841 000dfec8 000d903c 001c4174 74656d70 7420746f 20726564 6566696e 65207375 62747970 6520009d b464fefa
1544620  000d915c 000dff58 02003647 b3280000 000e4afc 00000000 2cacd719 0002438a 2ca0d6f9 00000000 00000001 000d92b8
1544700  000d92b8 0002438a 000dff44 000d92c4 000a636f 6e737472 61696e74 000dff4a b464d631 000d94cc 000dffbc 000b6163
1544760  7475616c 5f706172 74000000 000b77c8 030045bf 00002c07 0000000c 000e0058 000e0058 00010056 00000000 2cacff8a
1545040  0002438a 2ca0ff92 00000000 00000001 000d9584 000d9688 0002438a 000dffb8 000dffd4 b464ffb2 000d9630 000dfff8
1545120  2b24d465 0002438a 000d9698 03003287 29c8d421 000dffc8 000d9594 000f556e 64656669 6e656420 74797065 2000ffea
1545200  b464d391 000d96f8 000e003c 000b666f 726d616c 5f706172 74000000 2cac0001 0002438a 2ca0000b 00000000 00000001
1545260  000d9814 000d9814 0002438a 000e0038 000d9820 b4640041 000d9994 000e0080 000c636f 6d706f6e 656e742e 706c0000
1545340  2cac000b 0002438a 2ca020bf 00000000 00000001 000d9a1c 000d9ad0 0002438a 000e007c 000e0098 b4640567 000d9a80
1545420  000e00b8 2b240023 0002438a 000d9ae0 03003287 29c82a47 000e008c 000d9a2c 000c696e 64657865 645f6e61 6d65000b
1545500  b4640abf 000d9b34 000e011c 000b6173 736f635f 656c6d6e 74000000 000b7884 030045d7 00002c07 0000000c 000e03b4
1545560  000e03b4 00010056 00000000 2cac088f 0002438a 2ca00abf 00000000 00000001 000d9bbc 000d9f18 0002438a 000e0118
1545640  000e0134 b4642037 000d9c20 000e0154 2aa80557 000e0180 000d9c80 03003287 29c8000b 000e0128 000d9bcc 000a736c
1545720  6963655f 6e616d65 0000088f b464008f 000d9cd4 000e018c 000b790c 030045df 00002c07 0000000c 000e03f8 000e03f8
1546000  00010056 00000000 2aa80171 000e0198 000d9d34 b464088f 000d9d88 000e01a4 2aa80185 000e01b0 000d9de8 b464088f
1546060  000d9e3c 000e01bc 2aa82a47 000e01c8 000d9e90 b46420bf 000d9ee0 000e01f8 2b240d0f 0002438a 000d9f28 00067072
```

```
1546140  6566697a 000e01c5 00067375 6666697a 000e01f1 00087365 6c656374 6564000b b464088f 000d9f6c 000e027c 03003287
1546220  29c8000b 000e0600 000dd810 000b7954 010045e7 00002c07 0000000c 000e0298 000e0298 00010056 00000000 000b79c8
1546300  010045ef 00002c07 0000000c 000e0300 000e0300 00010056 00000000 2cac0241 0002438a 2ca0000b 00000000 00000001
1546360  000da038 000da038 0002438a 000e0278 000da044 b4640281 000dd3c4 000e02bc 00004617 b3280000 000dd6c0 00000000
1546440  2cac0d27 0002438a 2ca02017 00000000 00000001 000a72c4 000a95a8 0002438a 000dd434 b46402a9 000a94f8 000e02c4
1546520  2b24088f 0002438a 000a95b8 03003287 29c8000b 000e02c8 000a72d4 b46402e9 000a96bc 000e0328 0000468f b328fd9c
1546600  000e28cc 00000000 2cac3c07 0002438a 2ca02037 00000000 00000001 000a9744 000a9984 0002438a 000e0324 000e0340
1546660  b4642a47 000a97a8 000e0350 2aa8008f 000e035c 000a97f0 03003287 29c8088f 000e0334 000a9754 b4642a47 000a9834
1546740  000e0368 2aa820bf 000e0374 000a987c b464040f 000a98c0 000e0380 2aa80365 000e038c 000a9908 b464088f 000a994c
1547020  000e0398 2b240379 0002438a 000a9994 b464088f 000a99dc 000e03dc 00004a3f b3280043 000f40fc 00000000 2cac03b9
1547100  0002438a 2ca00033 00000000 00000001 000a9adc 000a9adc 0002438a 000e03d8 000a9ae8 b46403cd 000a9c10 000e0420
1547160  00004617 b3280557 000dd694 00000000 2cac2a47 0002438a 2ca0098f 00000000 00000001 000a9ce0 000a9ce0 0002438a
1547240  000e041c 000a9cec b4642a47 000a9dc8 000e0464 000c7375 6270726f 6763616c 6c730000 2cac0013 0002438a 2ca00435
1547320  00000000 00000001 000a9f79 000aa0e0 0002438a 000e0460 000e047c b464004b 000aa028 000e0618 2b240475 0002438a
1547400  000aa0f0 03003287 29c800cf 000e0470 000a9f88 b4640000 000e3528 000e6aa0 00116163 7475616c 5f646573 69676e61
1547460  746f7200 b4640490 000e346c 000e048c 000f706f 72745f6d 61705f61 73706563 74000000 000dda6c 000e0204 2b2404b0
1547540  0002438a 000e33e0 b46404d8 000e335c 000e04ac 2aa804e4 000e04d4 000e3318 b46404f0 000e32d0 000e04e0 b4640514
1547620  000e0770 000e0510 b4640520 000e09d8 000e051c b464052c 000e0bcc 000e0540 b4640550 000e1098 000e054c b464052c
1547700  000e2b80 000e0524 b4640538 000e2964 000e0534 b46404fc 000e320c 000e04f8 b4640550 000de2f4 000e0504 2b24055c
1547760  0002438a 000de2ac b4640568 000de264 000e0558 2aa80574 000e0564 000de210 b4640580 000de1b0 000e0570 b464058c
1550040  000de0c4 000e0588 b4640598 000ddfd8 000e0594 2b2405a4 0002439a 000ddfac b46405b0 000ddf68 000e05a0 b46405bc
1550120  000dd884 000e05b8 2b2405c8 0002438a 000dd20 b46405d4 000ddcb0 000e05c4 b46405e0 000ddb18 000e05dc b46405ec
1550200  000dd9a0 000e05e0 2b2405f4 0002438a 000dd954 b4640604 000dd8f8 000e05f4 b4640610 000dd72c 000e060c 00076675
1550260  6e63616c 6c000630 00077479 70652e70 6c00063c 000e073c 0000002c b288b66c 00000586 7fffffff 000da100 02000ce5
1550340  0100147d 01002d65 0000000b 00002aff 002c2f68 6f6d652f 6f736173 312f612f 73726565 2f73656d 616e7469 635f6368
1550420  65636b31 2f636f6d 706f6e65 6e74003c 002f2f68 6f6d652f 6f736173 312f612f 73726565 2f73656d 616e7469 635f6368
1550500  65636b31 2f636f6d 706f6e65 6e742e70 6c004176 0000002c 000e28c8 b27cb66c 00000588 7fffffff 000dd690 02000ce5
1550560  0200293d 0000465f 000002c3 00002aff 0000002c 000e28f4 b27cb66c 00000593 7fffffff 000dd6bc 02000ce5 02001f6d
1550640  0000465f 00002c07 00002aff 0010656e 74697479 5f6e616d 655f6c69 73740000 000e0834 0000002c b27cb66c 0000058a
1550720  00000592 0009cbc1 02000ce5 02002385 0000465f 00002c07 00002aff 000000cc 000de2f0 b27cb66c 0000058b 7fffffff
1551000  000e09d4 02000ce5 020031ed 020031e5 00003eff 02000a3d 02003645 00003407 0000000c 02000a3d 02003645 00000010
1551060  00000014 02000a3d 02000885 00004227 00000018 02000a3d 02003645 00003437 0000001c 02000a3d 02003645 00003407
1551140  00000020 02000a3d 0100371d 00000022 01002d65 03003ead 00003407 00000012 00000024 020031f5 00003ebf 02000a3d
1551220  02000cdd 00000026 01001b85 01003d3d 0000000e 02000885 0000001a 01003ebd 00000026 00002aff 000e0a88 00000064
1551300  b27cb66c 0000058c 00000594 000e0a8c 02000ce5 05001b0d 00003eff 0000001b 00002c07 00663f03 000002c3 00002aff
1551360  000e0a88 0000002c b4f0b4e4 0000058b 7fffffff 0007eaad 00000000 00000000 000e0c5c 0002438a 000e48d8 2c780138
1551440  0002438a 5d100000 03003287 4b8c0000 00003eff 64205818 67ec001c 55f0687c 003c55f0 6af00034 55f06af0 002c55f0
1551520  6af00024 55f06aa0 537056f8 671c5370 5d100000 020031f7 4b8c0000 00003ebf 5a180000 02000a3f 60cc5aec 02000cdf
1551600  6a0058e0 01001b87 5a180000 01003d3f 671c5c30 02000887 6e580034 5a180000 01003ebf 6d8036a4 47900020 35400018
1551660  00403678 001c35c8 43000000 00003407 000cc5cc 00443540 00180038 3f680040 3894003c 320c1280 24d00000 000cc5cc
1551740  003c3410 00303e70 00383c9c 00000034 000d4b54 00343540 00180028 3f680030 3894002c 320c42ac 00003437 000cc5cc
1552020  002c3540 0018001c 3f680028 38940024 314842ac 00003407 000cc5cc 002438fc 00203eec 001c3818 40f40000 000cc8c0
1552100  00143858 342441d4 00003407 242c0000 000cc62c 000000b8 000e076c b27cb66c 0000058d 7fffffff 000e0bc8 02000ce5
1552160  020031ed 020031e5 00003fcf 02000a3d 02003645 0000000c 00000010 02000a3d 010040dd 00000014 02000a3d 02003645
1552240  00000018 0000001c 02000a3d 02000885 00004667 00000020 0100371d 0000001e 020031f5 01003ebd 00000024 02000a3d
1552320  02000885 00000022 02003ff5 00000026 00000028 02000cdd 00000026 01001b85 02003ac5 0000002c 0300466d 0000000e
1552400  0000001a 0000002a 00002aff 000e0c58 00000038 b27cb66c 0000058e 00000595 000e0c5c 02000ce5 05001b0d 00003fcf
1552460  0000001b 00002c07 00676b43 000002c3 00002aff 2c780104 0002438a 5d100000 03003287 4b8c0000 00003fcf 64205818
1552540  67ec001c 55f0687c 003055f0 6af00028 55f06af0 001c55f0 6a005370 56f8671c 53705aec 020031f7 60cc5aec 01003ebf
1552620  671c5c30 02000a3f 65100018 5e540000 02000887 6e58001c 5a180000 02003ff7 6b7467b8 5c9c0018 02000cdf 6b7458e0
1552700  01001b87 5a180000 02003ac7 5fa058e0 0300466f 671c6af0 00246c34 36a4477c 35400018 00343678 001c320c 24d00000
1552760  000cc5cc 003834a0 002c3eec 0034382c 003031f0 24d00000 000cfb74 00303540 00180020 3f68002c 38940029 33103c9c
1553040  00000024 000cc5cc 002433d8 3e700020 3af4001c 000e276c 001c38e8 3d6c37f0 3cf4234c 000cc8c0 00000094 000e09d4
1553120  b27cb66c 0000058f 7fffffff 000e2960 02000ce5 020031ed 020031e5 00004667 02000a3d 02003645 000034b7 0000000c
1553200  02000a3d 02003645 0000347f 00000010 02000a3d 010036d5 00000014 02000a3d 02000885 00004177 00000018 010036dd
```

```
1553260  0000001c 020031f5 02003ff5 00000020 00000024 02000895 0000001a 02003ff5 00000022 00000026 00002aff 000e0d64
1553340  00000038 b130b66c 00000590 00000596 000e0871 02000ce5 05001h0d 00004667 0000001b 00002c07 00713b63 000002c3
1553420  00002aff 2c780044 0002438a 5d100000 03003287 4b8c0000 00004667 60cc56f8 671c55f0 687c0028 55f06af0 002055f0
1553500  6aa055f0 69b05370 581867b8 51705c30 020031f7 6530001c 5e540000 02003ff7 66700018 5c9c001c 02000887 6e0858e0
1553560  02003ff7 6c840018 6c3436a4 47683540 0018002c 362c320c 43000000 000034b7 000cc5cc 00303540 00180024 3f68002c
1553640  34940028 320c42ac 0000347f 000cc5cc 002834a0 001c3eec 0024382c 002031f0 24300000 000cf098 002033bc 3e70001c
1553720  3c480000 000d0590 001838d4 3d6037dc 31f0234c 000cf0d8 000e2834 000018e4 000e0d54 000e0482 0300088f 00000ee3
1554000  000e0531 000e0519 000e0d71 000e049a 0300088f 00001b73 000e0545 000e0559 000e0d89 000e0db2 0300088f 00000ee3
1554060  000e0599 000e0581 000e0da1 000e0dc2 0100088f 00001033 000e0db9 000e0dd6 0200088f 00001173 000e05c1 000e0dc9
1554140  000e0dee 0300088f 00000ee3 000e0601 000e05e9 000e0dd4 000e0e02 0200088f 00001073 000e0615 000e0df5 000e0e16
1554220  0200088f 00001073 000e0629 000e0e09 000e0e2a 0200088f 00000571 000e0649 000e0e1d 000e0e3e 0200088f 00000583
1554300  000e0669 000e0e31 000e0e4e 0100088f 00000263 000e0e45 000e0e62 0200088f 000004b3 000e06fd 000e0e55 000e0e76
1554360  0200088f 00000033 000dd1f9 000e0e69 00000007 01001eaf 006bf923 000e0e92 000df38d 000e0f0a 000df3b1 000e0e9a
1554440  000df3d1 000e0ea2 000df411 000e0eaa 000df435 000e0eb2 000df455 000e0eba 000df495 000e0ec2 000df4b9 000e0eca
1554520  000df519 000e0ed2 000df53d 000e0eda 000df55d 000e0ee2 000df59d 000e0eea 000df5c1 000e0ef2 000df5e1 000e0efa
1554600  000df621 000e0f02 000df6a5 000e0f12 000dfe41 000e0f1a 000dfee5 000e0f22 000dffed 00000007 000e0035 000e0f2a
1554660  000e0059 000e0f32 000e007d 00000007 000deda1 000e0f42 000dedc1 000e0f4a 000dee01 000e0f52 000dee25 000e0f5a
1554740  000dee85 000e0f62 000deea9 000e0f6a 000def09 000e0f72 000def2d 000e0f7a 000def4d 000e0f82 000def8d 000e0f92
1555020  000defb1 000e0f9a 000deff1 000e0ff2 000df015 000e0fa2 000df035 000e0faa 000df075 000e0fb2 000df099 000e0fba
1555100  000df0b9 000e0fc2 000df0f9 000e0fca 000df11d 000e0f42 000df17d 000e0fda 000df309 000e0fe2 000df38d 000e0fea
1555160  000dfe41 00000007 000dffed 00000007 000deda1 000e1002 000dedc1 000e100a 000dee01 000e1012 000dee25 000e101a
1555240  000dee85 000e1052 000deea9 000e102a 000def09 000e1032 000def2d 000e103a 000def4d 000e1042 000def8d 000e104a
1555320  000deff1 00000007 000dffed 00000007 000deda1 000e106a 000dedc1 000e1072 000dee01 00000007 000dee25 000e107a
1555400  000dee85 000e1082 000dffed 00000007 06002c57 00000003 000e0154 000e0158 00002baf 000ded8d 000e0164 0300260f
1555460  000de9a0 000e1089 000de9a8 02000d27 000e1098 000e10a5 02000a57 000e109c 000e10b5 0300260f 000de9dc 000e014d
1555540  000de9e4 02000d27 000de9c5 000e10cd 02000a57 000e10ad 000e10d0 000020e7 000dedc1 000e110a 000dee25 000e1112
1555620  000dee85 00000007 000dffed 00000007 06002c57 0000000b 000e0178 000e017c 00002baf 000dedad 000e0188 0300260f
1555700  000dd0e0 000e1119 000dd0e9 02000d27 000e1128 000e1135 02000a57 000e112c 000e1145 0300260f 000dd11c 000e0171
1555760  000dd124 02000d27 000dd105 000e115d 02000a57 000e1130 000e116d 000020e7 06002c57 00000013 000e01a4 000e01a8
1556040  00002baf 000dee0d 000e01b4 0300260f 000dea5c 000e1189 000dea64 02000d27 000e1198 000e11a5 02000a57 000e119c
1556120  000e11b5 0300260f 000deb80 000e019d 000deb88 02000d27 000deb65 000e11cd 02000a57 000e11a0 000e11dd 000020e7
1556200  000deea9 000e1202 000def09 00000007 000def2d 000e1212 000def4d 000e121a 000def8d 000e1222 000deff1 00000007
1556260  06002c57 0000001b 000e01d0 000e01d4 00002baf 000dee91 000e01e0 0300260f 000dd19c 000e1229 000dd1a4 02000d27
1556340  000e1238 000e1245 02000a57 000e123c 000e1255 0300260f 000dd1d8 000e01c9 000dd1e0 02000d27 000dd1c1 000e126d
1556420  02000a57 000e1240 000e1274 000020e7 000def2d 000e12aa 000def4d 000e12b2 000def8d 00000007 000deff1 00000007
1556500  06002c57 00000023 000e01fc 000e0200 00002baf 000def15 000e020c 0300260f 000de8dc 000e12b9 000de8e4 02000d27
1556560  000e12c8 000e12d5 02000a57 000e12cc 000e12e5 0300260f 000de918 000e01f5 000de920 02000d27 000de901 000e12fd
1556640  02000a57 000e12d0 000e130d 000020e7 06002c57 0000002b 000e0220 000e0224 00002baf 000def39 000e0230 0300260f
1556720  000dd22c 000e1329 000dd234 02000427 000e1338 000e1345 02000a57 000e133c 000e1355 0300260f 000dd268 000e0219
1557000  000dd270 02000d27 000dd251 000e136d 02000a57 000e1340 000e137d 000020e7 000defb1 000e13a2 000df015 000e13aa
1557060  000df035 000e13b2 000df075 000e13ea 000df099 000e13c2 000df0b9 000e13ca 000df0f9 000e13d2 000df11d 000e13da
1557140  000df17d 000e13e2 000df309 00000007 000df38d 000e13f2 000dfe41 00000007 000defb1 000e1422 000df015 000e140a
1557220  000df035 000e1412 000df075 000e141a 000df38d 00000007 000dfe41 00000007 06002c57 00000033 000e024c 000e0250
1557300  00002baf 000def99 000e025c 0300260f 000de96c 000e1429 000de974 02000d27 000e1438 000e1445 02000a57 000e143c
1557360  000e1455 0300260f 000dd7a4 000e0245 000dd7ac 02000d27 00002baf 000e146d 02000a57 000e1440 000e147d 000020e7
1557440  000df015 000e14aa 000df035 000e14b2 000df075 00000007 000df38d 00000007 06002c57 0000003b 000e0278 000e027c
1557520  00002baf 000deffd 000e0288 0300260f 000de420 000e14b9 000de428 02000d27 000e14c8 000e14d5 02000a57 000e14cc
1557600  000e14e5 0300260f 000de45c 000e0271 000de464 02000d27 000de445 000e14fd 02000a57 000e14d0 000e150d 000020e7
1557660  06002c57 00000043 000e029c 000e02a0 00002baf 000df021 000e02ac 0300260f 000dd2bc 000e1529 000dd2c4 02000d27
1557740  000e1538 000e1545 02000a57 000e153c 000e1555 0300260f 000dd2f8 000e0295 000dd300 02000d27 000dd2e1 000e156d
1560020  02000a57 000e1540 000e157d 000020e7 000df099 000e15aa 000df0b9 000e15b2 000df0f9 00000007 000df11d 000e15ba
1560100  000df17d 000e15c2 000df307 00000007 06002c57 0000004b 000e02c8 000e02cc 00002baf 000df081 000e02d8 0300260f
1560160  000de5a8 000e15c9 000de5b0 02000d27 000e15d8 000e15e5 02000a57 000e15dc 000e15f5 0300260f 000de5e4 000e02c1
1560240  000de5ec 02000d27 000de5cd 000e160d 02000a57 000e15e0 000e161d 000020e7 000df0b9 000e1652 000df11d 000e164a
1560320  000df17d 00000007 000df309 00000007 06002c57 00000053 000e02ec 000e02f0 00002baf 000df0a5 000e02fc 0300260f
```

1201 1202

| | | | | | | | | | | | | |
|---|---|---|---|---|---|---|---|---|---|---|---|---|
| 1560400 | 000de4b0 | 000e1659 | 000de4b9 | 02000d27 | 000e1668 | 000e1675 | 02000a57 | 000e166c | 000e1685 | 0300260f | 000de4ec | 000e02e5 |
| 1560460 | 000de4f4 | 02000d27 | 000de4d5 | 000e169d | 02000a57 | 000e1679 | 000e16ad | 000020e7 | 06002c57 | 0000005b | 000e0318 | 000e031c |
| 1560540 | 00002baf | 000df105 | 000e0328 | 0300260f | 000de7ec | 000e16c9 | 000de7f4 | 02000d27 | 000e16d8 | 000e16e5 | 02000a57 | 000e16dc |
| 1560620 | 000e16f5 | 0300260f | 000de828 | 000e0311 | 000de830 | 02000d27 | 000de811 | 000e170d | 02000a57 | 000e16e0 | 000e171d | 000020e7 |
| 1560700 | 000df13d | 000e1742 | 000df1a1 | 000e174a | 000df201 | 000e1752 | 000df225 | 000e175a | 000df245 | 000e1762 | 000df285 | 000e176a |
| 1560760 | 000df2c9 | 000e1772 | 000df32d | 000e177a | 000df34d | 000e1782 | 000df3b1 | 000e1792 | 000df3d1 | 000e179a | 000df411 | 000e17a2 |
| 1561040 | 000df435 | 000e17aa | 000df455 | 000e1802 | 000df495 | 000e17b2 | 000df4b9 | 000e17ba | 000df519 | 000e17c2 | 000df53d | 000e17ca |
| 1561120 | 000df55d | 000e17d2 | 000df59d | 000e17da | 000df5c1 | 000e17e2 | 000df5e1 | 000e17ea | 000df621 | 000e17f2 | 000df6a5 | 000e17fa |
| 1561200 | 000dfee5 | 000e1812 | 000e0035 | 000e180a | 000e0059 | 00000007 | 000e007d | 00000007 | 000df13d | 000e1822 | 000df1a1 | 000e182a |
| 1561260 | 000df201 | 000e1832 | 000df225 | 000e1852 | 000df245 | 000e1842 | 000df285 | 000e184a | 000df2c9 | 000e185a | 000df32d | 000e1872 |
| 1561340 | 000df34d | 000e1862 | 000df3b1 | 000e186a | 000df411 | 000e187a | 000df455 | 000e1882 | 000e0035 | 00000007 | 000e0059 | 00000007 |
| 1561420 | 000df13d | 000e189a | 000df1a1 | 000e18a2 | 000df201 | 00000007 | 000df225 | 000e18aa | 000df32d | 000e18b2 | 000df455 | 000e18ba |
| 1561500 | 000e0059 | 00000007 | 06002c57 | 00000063 | 000e033c | 000e0340 | 00002baf | 000df129 | 000e034c | 0300260f | 000de638 | 000e18c1 |
| 1561560 | 000de640 | 02000d27 | 000e18d0 | 000e18dd | 02000a57 | 000e18d4 | 000e18ed | 0300260f | 000de674 | 000e0335 | 000de67c | 02000d27 |
| 1561640 | 000de65d | 000e1905 | 02000a57 | 000e18d8 | 000e1915 | 000020e7 | 000df1a1 | 000e1952 | 000df225 | 000e1942 | 000df32d | 000e194a |
| 1561720 | 000df455 | 00000007 | 000e0059 | 00000007 | 06002c57 | 0000006b | 000e0368 | 000e036c | 00002baf | 000df189 | 000e0378 | 0300260f |
| 1562000 | 000de8a8 | 000e1959 | 000de8b0 | 02000d27 | 000e1968 | 000e1975 | 02000a57 | 000e196c | 000e1985 | 0300260f | 000dec34 | 000e0361 |
| 1562060 | 000dec3c | 02000d27 | 000dec19 | 000e199d | 02000a57 | 000e1970 | 000e19ad | 000020e7 | 06002c57 | 00000073 | 000e0394 | 000e0398 |
| 1562140 | 00002baf | 000df20d | 000e03a4 | 0300260f | 000de7b8 | 000e19c9 | 000de7c0 | 02000d27 | 000e19d9 | 000e19e5 | 02000a57 | 000e19dc |
| 1562220 | 000e19f5 | 0300260f | 000de2fc | 000e038d | 000de104 | 02000d27 | 00002baf | 000e1a0d | 02000a57 | 000e19e0 | 000e1a1d | 000020e7 |
| 1562300 | 000df245 | 000e1a42 | 000df285 | 00000007 | 000df2c9 | 000e1a52 | 000df34d | 000e1a5a | 000df3b1 | 000e1a62 | 000df411 | 000e1a6a |
| 1562360 | 000e0035 | 00000007 | 06002c57 | 0000007b | 000e03b8 | 000e03bc | 00002baf | 000df231 | 000e03c8 | 0300260f | 000de6c8 | 000e1a71 |
| 1562440 | 000de6d0 | 02000d27 | 000e1a80 | 000e1a8d | 02000a57 | 000e1a84 | 000e1a9d | 0300260f | 000de704 | 000e03b1 | 000de70c | 02000d27 |
| 1562520 | 000de6ed | 000e1ab5 | 02000a57 | 000e1a88 | 000e1ac5 | 000020e7 | 000df2c9 | 000e1aea | 000df34d | 000e1b02 | 000df3b1 | 000e1afa |
| 1562600 | 000df411 | 00000007 | 000e0035 | 00000007 | 06002c57 | 00000083 | 000e03e4 | 000e03e8 | 00002baf | 000df2b5 | 000e03f4 | 0300260f |
| 1562660 | 000de758 | 000e1b09 | 000de760 | 02000d27 | 000e1b18 | 000e1b25 | 02000a57 | 000e1b1c | 000e1b35 | 0300260f | 000debf8 | 000e03dd |
| 1562740 | 000dec00 | 02000d27 | 000debdd | 000e1b4d | 02000a57 | 000e1b20 | 000e1b5d | 000020e7 | 06002c57 | 0000008b | 000e0428 | 000e042c |
| 1563020 | 00002baf | 000df399 | 000e0438 | 0300260f | 000de26c | 000e1b79 | 000de274 | 02000d27 | 000e1b88 | 000e1b95 | 02000a57 | 000e1b8c |
| 1563100 | 000e1ba5 | 0300260f | 000de2a8 | 000e0421 | 000de2b0 | 02000d27 | 000de291 | 000e1bbd | 02000a57 | 000e1b90 | 000e1bcd | 000020e7 |
| 1563160 | 000df3d1 | 000e1bf2 | 000df435 | 000e1bfa | 000df495 | 000e1c02 | 000df4b9 | 000e1c0a | 000df519 | 000e1c4a | 000df53d | 000e1c1a |
| 1563240 | 000df55d | 000e1c22 | 000df59d | 000e1c2a | 000df5c1 | 000e1c32 | 000df5e1 | 000e1c3a | 000df621 | 000e1c42 | 000df6a5 | 000e1c52 |
| 1563320 | 000dfee5 | 00000007 | 000e007d | 00000007 | 000df3d1 | 000e1c7a | 000df435 | 000e1c6a | 000df495 | 000e1c72 | 000df4b9 | 000e1c82 |
| 1563400 | 000df519 | 00000007 | 000dfee5 | 00000007 | 06002c57 | 00000093 | 000e044c | 000e0450 | 00002baf | 000df3bd | 000e045c | 0300260f |
| 1563460 | 000dd34c | 000e1c89 | 000dd354 | 02000d27 | 000e1c98 | 000e1ca5 | 02000a57 | 000e1c9c | 000e1cb5 | 0300260f | 000dd388 | 000e0445 |
| 1563540 | 000dd390 | 02000d27 | 000dd371 | 000e1ccd | 02000a57 | 000e1ca0 | 000e1cdd | 000020e7 | 000df435 | 000e1d02 | 000df495 | 00000007 |
| 1563620 | 000df4b9 | 000e1d12 | 000dfee5 | 00000007 | 06002c57 | 0000009b | 000e0479 | 000e047c | 00002baf | 000df41d | 000e0488 | 0300260f |
| 1563700 | 000de330 | 000e1d19 | 000de338 | 02000d27 | 000e1d28 | 000e1d35 | 02000a57 | 000e1d2c | 000e1d45 | 0300260f | 000de36c | 000e0471 |
| 1563760 | 000de374 | 02000d27 | 000de355 | 000e1d5d | 02000a57 | 000e1d30 | 000e1d6d | 000020e7 | 06002c57 | 000000a3 | 000e04ac | 000e04b0 |
| 1564040 | 00002baf | 000df4a1 | 000e04bc | 0300260f | 000de3ec | 000e1d89 | 000de3f4 | 02000d27 | 000e1d98 | 000e1da5 | 02000a57 | 000e1d9c |
| 1564120 | 000e1db5 | 0300260f | 000dd73c | 000e04a5 | 000dd744 | 02000d27 | 00002baf | 000e1dcd | 02000a57 | 000e1da0 | 000e1ddd | 000020e7 |
| 1564200 | 000df53d | 000e1e02 | 000df55d | 000e1e0a | 000df59d | 000e1e2a | 000df5c1 | 000e1e1a | 000df5e1 | 000e1e22 | 000df621 | 000e1e32 |
| 1564260 | 000df6a5 | 00000007 | 000e007d | 00000007 | 000df53d | 000e1e4a | 000df55d | 000e1e52 | 000df59d | 00000007 | 000df6a5 | 00000007 |
| 1564340 | 06002c57 | 000000ab | 000e04d8 | 000e04dc | 00002baf | 000df525 | 000e04e8 | 0300260f | 000de0b0 | 000e1e59 | 000de0b8 | 02000d27 |
| 1564420 | 000e1e68 | 000e1e75 | 02000a57 | 000e1e6c | 000e1e85 | 0300260f | 000de0ec | 000e04d1 | 000de0f4 | 02000d27 | 000de0d5 | 000e1e9d |
| 1564500 | 02000a57 | 000e1e70 | 000e1ead | 000020e7 | 06002c57 | 000000b3 | 000e04fc | 000e0500 | 00002baf | 000df549 | 000e050c | 0300260f |
| 1564560 | 000dd3dc | 000e1ec9 | 000dd3e4 | 02000d27 | 000e1ed8 | 000e1ee5 | 02000a57 | 000e1edc | 000e1ef5 | 0300260f | 000dd418 | 000e04f5 |
| 1564640 | 000dd420 | 02000d27 | 000dd401 | 000e1f0d | 02000a57 | 000e1ee0 | 000e1f1d | 000020e7 | 000df5c1 | 000e1f4a | 000df5e1 | 000e1f52 |
| 1564720 | 000df621 | 00000007 | 000e007d | 00000007 | 06002c57 | 000000bb | 000e0528 | 000e052c | 00002baf | 000df5a9 | 000e0538 | 0300260f |
| 1565000 | 000de174 | 000e1f59 | 000de17c | 02000d27 | 000e1f68 | 000e1f75 | 02000a57 | 000e1f6c | 000e1f85 | 0300260f | 000de1b0 | 000e0521 |
| 1565060 | 000de1b8 | 02000d27 | 000de199 | 000e1f9d | 02000a57 | 000e1f70 | 000e1fad | 000020e7 | 06002c57 | 000000c3 | 000e054c | 000e0550 |
| 1565140 | 00002baf | 000df5cd | 000e055c | 0300260f | 000de140 | 000e1fc9 | 000de148 | 02000d27 | 000e1fd8 | 000e1fe5 | 02000a57 | 000e1fdc |
| 1565220 | 000e1ff5 | 0300260f | 000dec70 | 000e0545 | 000dec78 | 02000d27 | 000dec55 | 000e200d | 02000a57 | 000e1fe0 | 000e201d | 000020e7 |
| 1565300 | 000df645 | 000e2042 | 000df665 | 000e204a | 000df6c9 | 000e2052 | 000df6e9 | 000e205a | 000df729 | 000e2062 | 000df74d | 000e206a |
| 1565360 | 000df76d | 000e2072 | 000df79d | 000e207a | 000df7cd | 000e2082 | 000df7f1 | 000e208a | 000df811 | 000e2092 | 000df851 | 000e209a |
| 1565440 | 000df875 | 000e20a2 | 000df895 | 000e20aa | 000df8b5 | 000e20b2 | 000df8f5 | 000e20ba | 000df919 | 000e20c2 | 000df939 | 000e20ca |

| | | | | | | | | | | | | |
|---|---|---|---|---|---|---|---|---|---|---|---|---|
| 1565520 | 000df979 | 000e20d2 | 000df99d | 000e20e2 | 000df9bd | 000e20ea | 000df9fd | 000e2102 | 000dfa21 | 000e20f2 | 000dfa41 | 000e20fa |
| 1565600 | 000dfa81 | 000e210a | 000dfaa5 | 000e211a | 000dfb05 | 000e2112 | 000dfb29 | 000e2122 | 000dfb49 | 000e2142 | 000dfb89 | 000e212a |
| 1565660 | 000dfbad | 000e2132 | 000dfbcd | 000e213a | 000dfc0d | 000e215a | 000dfc31 | 000e214a | 000dfc51 | 000e2152 | 000dfc91 | 000e218a |
| 1565740 | 000dfcb5 | 000e2162 | 000dfcd5 | 000e216a | 000dfd15 | 000e2172 | 000dfd39 | 000e217a | 000dfd59 | 000e2182 | 000dfd99 | 000e2192 |
| 1566020 | 000dfdbd | 000e21e2 | 000dfddd | 000e219a | 000dfe1d | 000e21a2 | 000dfe61 | 000e21aa | 000dfea1 | 000e21b2 | 000dfec5 | 000e21ba |
| 1566100 | 000dff25 | 000e21c2 | 000dff55 | 000e21ca | 000dffa5 | 000e21d2 | 000dffc9 | 000e21da | 000e0011 | 00000007 | 000e00a1 | 000e21ea |
| 1566160 | 000e00c5 | 000e21f2 | 000e00e9 | 00000007 | 000df645 | 000e2202 | 000df665 | 000e220a | 000df6c9 | 000e2212 | 000df6e9 | 000e221a |
| 1566240 | 000df729 | 000e2222 | 000df744 | 000e222a | 000df76d | 000e2232 | 000df78d | 000e223a | 000df7cd | 000e225a | 000df7f1 | 000e224a |
| 1566320 | 000df811 | 000e2252 | 000df851 | 000e2262 | 000df875 | 000e22a2 | 000df895 | 000e226a | 000df8b5 | 000e2272 | 000df8f5 | 000e227a |
| 1566400 | 000df919 | 000e2282 | 000df939 | 000e228a | 000df979 | 000e2292 | 000df99d | 000e229a | 000df9fd | 000e22aa | 000dfaa5 | 000e22ba |
| 1566460 | 000dfb49 | 000e22b2 | 000dfc31 | 000e22c2 | 000dfc51 | 000e22ca | 000dfc91 | 000e22d2 | 000dfdb1 | 000e22da | 000e00a1 | 00000007 |
| 1566540 | 000e00c5 | 000e22e2 | 000e00e9 | 00000007 | 000df645 | 000e22f2 | 000df665 | 000e22fa | 000df6c9 | 000e230a | 000df6e9 | 000e231a |
| 1566620 | 000df729 | 000e2312 | 000df744 | 000e2332 | 000df76d | 000e2322 | 000df78d | 000e232a | 000df7cd | 000e234a | 000df875 | 000e233a |
| 1566700 | 000dfaa5 | 000e2342 | 000dfc51 | 000e235a | 000dfdbd | 000e2352 | 000e00c5 | 00000007 | 000e00e9 | 00000007 | 000df645 | 000e2392 |
| 1566760 | 000df665 | 000e2372 | 000df6c9 | 000e237a | 000df729 | 000e2392 | 000df74d | 000e238a | 000df875 | 000e23a2 | 000dfaa5 | 000e239a |
| 1567040 | 000dfc51 | 00000007 | 000e00e9 | 00000007 | 06002c57 | 000000cb | 000e0578 | 000e057c | 00002baf | 000df62d | 000e0588 | 0300260f |
| 1567120 | 000de238 | 000e23a9 | 000de240 | 02000127 | 000e23b8 | 000e23c5 | 02000a57 | 000e23bc | 000e23d5 | 0300260f | 000ddb44 | 000e0571 |
| 1567200 | 000ddb4c | 02000d27 | 00002baf | 000e23ed | 02000a57 | 000e23c0 | 000e23fd | 000020e7 | 000df665 | 000e2432 | 000df6c9 | 000e242a |
| 1567260 | 000df729 | 00000007 | 000df74d | 000e243a | 000df875 | 000e2442 | 000e00e9 | 00000007 | 06002c57 | 000000d3 | 000e059c | 000e05a0 |
| 1567340 | 00002baf | 000df651 | 000e05ac | 0300260f | 000de204 | 000e2449 | 000de20c | 02000d27 | 000e2458 | 000e2465 | 02000a57 | 000e245c |
| 1567420 | 000e2475 | 0300260f | 000ded24 | 000e0595 | 000ded2c | 02000d27 | 000ded09 | 000e2484 | 02000a57 | 000e2460 | 000e249d | 000020e7 |
| 1567500 | 06002c57 | 000000db | 000e05c8 | 000e05cc | 00002baf | 000df6b1 | 000e05d9 | 0300260f | 000ddf84 | 000e24b9 | 000ddf8c | 02000d27 |
| 1567560 | 000e24c8 | 000e24d5 | 02000a57 | 000e24cc | 000e24e5 | 0300260f | 000ddfc0 | 000e05c1 | 000ddfc8 | 02000d27 | 000ddfa9 | 000e24fd |
| 1567640 | 02000a57 | 000e24d0 | 000e250d | 000020e7 | 000df6e9 | 000e2542 | 000df76d | 000e253a | 000df78d | 000e254a | 000df7cd | 00000007 |
| 1567720 | 000dfdbd | 000e2552 | 000e00c5 | 00000007 | 05002c57 | 000000e3 | 000e05ec | 000e05f0 | 00002baf | 000df6d5 | 000e05fc | 0300260f |
| 1570000 | 000dd46c | 000e2559 | 000dd474 | 02000d27 | 000e2568 | 000e2575 | 02000a57 | 000e256c | 000e2585 | 0300260f | 000dd4a8 | 000e05e5 |
| 1570060 | 000dd4b0 | 02000d27 | 000dd491 | 000e2594 | 02000a57 | 000e2570 | 000e25ad | 000020e7 | 000df76d | 000e25e2 | 000df78d | 000e25da |
| 1570140 | 000dfdbd | 00000007 | 000e00c5 | 00000007 | 06002c57 | 000000eb | 000e0620 | 000e0624 | 00002baf | 000df759 | 000e0630 | 0300260f |
| 1570220 | 000de048 | 000e25e9 | 000de050 | 02000d27 | 000e25f8 | 000e2605 | 02000a57 | 000e25fc | 000e2615 | 0300260f | 000dece8 | 000e0619 |
| 1570300 | 000decf0 | 02000d27 | 000deccd | 2cac262d | 0002438a | 2ca02600 | 00000000 | 00000001 | 000dd820 | 000dd944 | 0002438a | 000e04d0 |
| 1570360 | 000bfb20 | 03004627 | 00002c07 | 0000000c | 000e270c | 000e270c | 00010057 | 00000000 | 000b7bf4 | 0300462f | 00002c07 | 0000000c |
| 1570440 | 000e2734 | 000e2734 | 00010057 | 00000000 | 2cac1934 | 0002438a | 2ca02baf | 00000000 | 00000001 | 000dda60 | 000dda60 | 0002438a |
| 1570520 | 000e04cc | ffffffff | 03004637 | 00002c07 | 0000000c | 000e27ec | 000e27ec | 00010057 | 00000000 | 000b7d44 | 0300463f | 00002c07 |
| 1570600 | 0000000c | 000e279c | 000e279c | 00010057 | 00000000 | 2cac2712 | 0002438a | 2ca0271a | 00000000 | 00000001 | 000ddbe4 | 000ddd10 |
| 1570660 | 0002438a | 000e2730 | 000dfe20 | 2cac0007 | 0002438a | 2ca00007 | 00000000 | 00000001 | 000dde6c | 000ddf9c | 0002438a | 000e2758 |
| 1570740 | 000dfce8 | 000b9280 | 03004667 | 00002c07 | 0000000c | 000e4880 | 000e4880 | 00010058 | 00000000 | 000cc5bc | 03004647 | 00002c07 |
| 1571020 | 0000000c | 000e27c4 | 000e27c4 | 00010057 | 00000000 | 2cac0d27 | 0002438a | 2ca0278d | 00000000 | 00000001 | 000de060 | 000de060 |
| 1571100 | 0002438a | 000e27c0 | 000de06c | 2cac0d27 | 0002438a | 2ca027b5 | 00000000 | 00000001 | 000de14c | 000de29c | 0002438a | 000e27e8 |
| 1571160 | 000dfc18 | 2cac27fa | 0002438a | 2ca00007 | 00000000 | 00000001 | 000de364 | 000de364 | 0002438a | 000e2810 | 000de370 | 0011636f |
| 1571240 | 6d706f6e | 656e745f | 696e7374 | 616e7400 | 000e0ac8 | 000e08a0 | 000e2930 | 0000002c | b288b66c | 00000597 | 7fffffff | 000da100 |
| 1571320 | 02000ce5 | 0100147d | 01002d65 | 0000000b | 00002aff | 002d2f68 | 6f6d652f | 6f736173 | 312f612f | 73726565 | 2f73656d | 616e7469 |
| 1571400 | 635f6368 | 65636b31 | 2f617474 | 72696275 | 74657300 | 00302f68 | 6f6d652f | 6f736173 | 312f612f | 73726565 | 2f73656d | 616e7469 |
| 1571460 | 635f6368 | 65636b31 | 2f617474 | 72696275 | 7465732e | 706c0049 | 0000002c | 000e4970 | b27cb66c | 00000599 | 7fffffff | 000e06d4 |
| 1571540 | 02000ce5 | 0200293d | 0000468f | 000002cb | 00002aff | 0000002c | 000e499c | b27cb66c | 000005bc | 7fffffff | 000e0700 | 02000ce5 |
| 1571620 | 02001f6d | 0000468f | 00002c07 | 00002aff | 00106c65 | 66742070 | 6172656e | 74686573 | 69730000 | 000e2a10 | 0000002c | b27cb66c |
| 1571700 | 0000059b | 000005bb | 0009cbc1 | 02000ce5 | 02002385 | 0000468f | 00002c07 | 00002aff | 000000b4 | 000e0bc8 | b27cb66c | 0000059c |
| 1571760 | 7fffffff | 000e2b7c | 02000ce5 | 020031ed | 020031e5 | 00003f07 | 02000a3d | 02003645 | 000033cf | 0000000c | 02000a3d | 02003645 |
| 1572040 | 00000010 | 00000014 | 02000a3d | 010040dd | 00000018 | 02000a3d | 02000885 | 00003c5f | 0000001c | 0100371d | 0000001a | 020031f5 |
| 1572120 | 01003ebd | 00000020 | 02000a3d | 02000885 | 0000001e | 02004005 | 00000022 | 00000024 | 02000cdd | 00000022 | 01001b85 | 02003ac5 |
| 1572200 | 0000000e | 020033cd | 00000012 | 00000026 | 00002aff | 000e2d44 | 00000064 | b27cb66c | 0000059d | 000005bd | 000e2d48 | 02000ce5 |
| 1572260 | 05001b0d | 00003f07 | 0000001b | 00002c07 | 03664003 | 000002cb | 00002aff | 000e2d44 | 0000002c | b4f0b4e4 | 0000059c | 7fffffff |
| 1572340 | 0007eaad | 00000000 | 00000000 | 000e37cc | 0002438a | 000e6cb0 | 2c780104 | 0002438a | 5d100000 | 03003287 | 4b8c0000 | 00003f07 |
| 1572420 | 64205818 | 67ec001c | 55f0687c | 003055f0 | 5af00024 | 55f06af0 | 001c55f0 | 6a005370 | 56f8671c | 53705aec | 020031f7 | 60cc5aec |
| 1572500 | 01003ebf | 671c5c30 | 02000a3f | 65300018 | 5e540000 | 02000887 | 6e58001c | 5a180000 | 02004007 | 6b7467b8 | 5c9c0018 | 02000cdf |
| 1572560 | 6b7458e0 | 01001b87 | 5a180000 | 02003ac7 | 671c58e0 | 020033cf | 6af0002c | 6c3436a4 | 477c3540 | 00180034 | 3678001c | 35c842ac |

| | | | | | | | | | | | | |
|---|---|---|---|---|---|---|---|---|---|---|---|---|
| 1572640 | 000033cf | 000cc5cc | 00383540 | 00180028 | 3f680034 | 38940030 | 320c3c9c | 0000002c | 000cc5cc | 002c34a0 | 00203eec | 0028382c |
| 1572720 | 00243280 | 24d00000 | 000cfb74 | 002433d8 | 3e700020 | 3af4001c | 000cf0f8 | 001c38e8 | 3d6c37f0 | 3cf4234c | 000cc8c0 | 000001cc |
| 1573000 | 000e2960 | b27cb66c | 0000059e | 7fffffff | 000e3094 | 02000ce5 | 020031ed | 020031e5 | 00003f0f | 02000a3d | 02003645 | 000033cf |
| 1573060 | 0000000c | 02000a3d | 02003645 | 00000010 | 00000014 | 02000a3d | 02003645 | 00003497 | 00000018 | 02000a3d | 02000885 | 00004697 |
| 1573140 | 0000001c | 02000a3d | 02003645 | 0000226f | 00000020 | 02000a3d | 02000885 | 00003b3f | 00000024 | 0100371d | 00000022 | 020031f5 |
| 1573220 | 01003ebd | 00000028 | 02000a31 | 02000d0d | 02000a65 | 02003bd5 | 02003ac5 | 0000002c | 020033cd | 00000012 | 00000030 | 0000002a |
| 1573300 | 00002aff | 02000a3d | 01002ced | 0000469f | 02000a3d | 01002ced | 00000012 | 02000a3d | 01002ced | 00003ad7 | 02000a3d | 01002ced |
| 1573360 | 0000000e | 02000a3d | 01002ced | 000046a7 | 00002527 | 02000a3d | 02000885 | 0000001e | 01003ff5 | 00000034 | 02000a3d | 02000885 |
| 1573440 | 00000026 | 02003ff5 | 0000002a | 00000038 | 02000a3d | 02000cdd | 0000002a | 01001b85 | 02003ac5 | 0000000e | 03003cdd | 00000012 |
| 1573520 | 00000036 | 0000003a | 02000d0d | 02000a65 | 02000d25 | 00000036 | 02004695 | 0000003c | 000034bf | 02000a3d | 02000d0d | 02000a65 |
| 1573600 | 010025e5 | 0000003a | 0200226d | 00000040 | 010021ed | 0000003a | 02000d25 | 00000042 | 0000003a | 02003cfd | 00003cd7 | 04003cdd |
| 1573660 | 0000002a | 00000012 | 0000003e | 00000042 | 00002aff | 00002aff | 000e311c | 00000038 | b27cb66c | 0000059f | 000005be | 000e3120 |
| 1573740 | 02000ce5 | 05001b0d | 00003f0f | 0000001b | 00002c07 | 00664103 | 000002cb | 00002aff | 2c780314 | 0002438a | 5d100000 | 03003287 |
| 1574020 | 4b8c0000 | 00003f0f | 64205818 | 67ec001c | 55f0687c | 004055f0 | 6af00034 | 55f06af0 | 002c55f0 | 6af00024 | 55f06af0 | 001c55f0 |
| 1574100 | 6a005370 | 56f8671c | 53705aec | 020031f7 | 64205c30 | 01003ebf | 67ec0020 | 5d100000 | 02000a3f | 60cc5aec | 02000d0f | 65800018 |
| 1574160 | 5c9c0018 | 02000a67 | 67ec0018 | 4b8c0000 | 00002aff | 5c9c0018 | 02003bd7 | 67ec0018 | 6c840020 | 5c9c0018 | 02003ac7 | 5fa058e0 |
| 1574240 | 020033cf | 6af0003c | 5fa05aec | 02000a3f | 65800018 | 5c9c0018 | 01002cef | 4b8c0000 | 0000469f | 5d100000 | 02000a3f | 65800018 |
| 1574320 | 5c9c0018 | 01002cef | 6e58003c | 5d100000 | 02000a3f | 65800018 | 5c9c0018 | 01002cef | 4b8c0000 | 00003ad7 | 5d100000 | 02000a3f |
| 1574400 | 61100018 | 5d100000 | 01002cef | 671c5ec0 | 00000018 | 02000a3f | 67ec0018 | 4b8c0000 | 00002527 | 5c9c0018 | 01002cef | 4b8c0000 |
| 1574460 | 000046a7 | 5e540000 | 02000a3f | 66700018 | 5c9c0018 | 02000887 | 6e58002c | 5a180000 | 01003ff7 | 67ec0018 | 5e540000 | 02000a3f |
| 1574540 | 66700024 | 5c9c0024 | 02000887 | 6e58001c | 5a180000 | 02003ff7 | 6c840020 | 67ec0028 | 5e540000 | 02000a3f | 66700024 | 5c9c0024 |
| 1574620 | 02000cdf | 6c840020 | 5a180000 | 01001b87 | 5a180000 | 02003ac7 | 6b7458e0 | 03003cdf | 6e58003c | 6c840018 | 6c840028 | 5e540000 |
| 1574700 | 02000d0f | 67b84af8 | 00002aff | 5e540000 | 02000a67 | 66700024 | 5c9c0024 | 02000d27 | 6c840018 | 5a180000 | 02004697 | 67ec0018 |
| 1574760 | 4b8c0000 | 000034bf | 5e540000 | 02000a3f | 65300024 | 5e540000 | 02000d0f | 6530002c | 5e540000 | 02000a67 | 66700030 | 5c9c0030 |
| 1575040 | 010025e7 | 6c840028 | 5e540000 | 0200226f | 67b858e0 | 010021ef | 6c840028 | 5c9c002c | 02000d27 | 6c346c84 | 00285ec0 | 00000024 |
| 1575120 | 02003cff | 4b8c0000 | 00003cd7 | 5a180000 | 04003cdf | 6c840020 | 6e58003c | 6c840018 | 6c3436a4 | 477c3540 | 00180044 | 3678001c |
| 1575200 | 35c842ac | 000033cf | 000cc5cc | 00483540 | 00180038 | 3f680044 | 38940040 | 320c3c9c | 0000003c | 000cc5cc | 003c3540 | 00180030 |
| 1575260 | 3f680038 | 38940034 | 320c42ac | 00003497 | 000cc5cc | 00343410 | 00283e70 | 00303c9c | 0000002c | 000e692c | 002c3540 | 00180020 |
| 1575340 | 3f680028 | 38940024 | 331042ac | 0000226f | 000cc5cc | 002433d8 | 3e700020 | 3af4001c | 000d72f4 | 001c38e8 | 3d6c37f0 | 3cf4234c |
| 1575420 | 000cc8c0 | 0000008c | 000e2b7c | b27cb66c | 000005a0 | 7fffffff | 000e3208 | 02000ce5 | 020031ed | 020031e5 | 00004697 | 02000a3d |
| 1575500 | 02000885 | 000046af | 0000000c | 02000a3d | 010040dd | 00000010 | 02000885 | 000046b7 | 00000014 | 020031f5 | 01003ff5 | 02004695 |
| 1575560 | 00000018 | 0000001c | 02000a3d | 02000885 | 0000000e | 01003ff5 | 0000001a | 02000885 | 00000016 | 01003ff5 | 0000001e | 00002aff |
| 1575640 | 000e3244 | 00000038 | b27cb66c | 000005a1 | 000005bf | 000e3248 | 02000ce5 | 05001b0d | 00004697 | 0000001b | 00002c07 | 00734963 |
| 1575720 | 000002cb | 00002aff | 2c7800b0 | 0002438a | 5d100000 | 03003287 | 4b8c0000 | 00004697 | 60cc56f8 | 671c55f0 | 686855f0 | 69b05370 |
| 1576000 | 581867b8 | 53705c30 | 020031f7 | 65300018 | 5e540000 | 01003ff7 | 5a180000 | 02004697 | 6670001c | 5c9c0018 | 02000a3f | 66c00020 |
| 1576060 | 00185ec0 | 00000020 | 02000887 | 6b7458e0 | 01003ff7 | 6c84001c | 5c9c0018 | 02000887 | 6d3c58e0 | 01003ff7 | 6c344768 | 3410001c |
| 1576140 | 24d00000 | 000e6970 | 0020344c | 3eec001c | 391831f0 | 24d00000 | 000cfb74 | 0018386c | 3d302340 | 000e6990 | 00000040 | 000e3094 |
| 1576220 | b27cb66c | 000005a2 | 7fffffff | 000e32cc | 02000ce5 | 020031ed | 020031e5 | 000046af | 02003645 | 0000349f | 0000000c | 01003ff5 |
| 1576300 | 0000349f | 00002aff | 000e34a4 | 00000038 | b27cb66c | 000005a3 | 000005c0 | 000e34a8 | 02000ce5 | 05001b0d | 000046af | 0000001b |
| 1576360 | 00002c07 | 00734b83 | 000002cb | C0002aff | 27f0004c | 000e3304 | 5d100000 | 03003287 | 4b8c0000 | 000046af | 60cc56f8 | 671c5370 |
| 1576440 | 581867b8 | 53705c30 | 01003ff7 | 4b8c0000 | 0000349f | 36a43724 | 0018362c | 320c41d4 | 0000349f | 239c0000 | 000cc5cc | 00000040 |
| 1576520 | 000e3208 | b27cb66c | 000005a4 | 7fffffff | 000e3358 | 02000ce5 | 020031ed | 020031e5 | 000046af | 02003645 | 00001aff | 0000000c |
| 1576600 | 01003ff5 | 00001aff | 00002aff | 28c4004c | 000e33d0 | 5d100000 | 03003287 | 4b8c0000 | 000046af | 60cc56f8 | 671c5370 | 581867b8 |
| 1576660 | 53705c30 | 01003ff7 | 4b8c0000 | 00001aff | 36a43724 | 0018362c | 320c41d4 | 00001aff | 239c0000 | 000cc5cc | 00000080 | 000e32cc |
| 1576740 | b27cb66c | 000005a5 | 7fffffff | 000e3468 | 02000ce5 | 020031ed | 020031e5 | 000046af | 02000a3d | 02000885 | 000046bf | 0000000c |
| 1577020 | 02000885 | 000046c7 | 00000010 | 020031f5 | 01003ff5 | 00000001 | 00000014 | 00000018 | 02000a3d | 02000885 | 0000000e | 01003ff5 |
| 1577100 | 00000016 | 02000885 | 00000012 | 01003ff5 | 0000001a | 00002aff | 29540090 | 0002438a | 5d100000 | 03003287 | 4b8c0000 | 000046af |
| 1577160 | 60cc56f8 | 671c55f0 | 682c5370 | 581867b8 | 53705c30 | 020031f7 | 65300018 | 5e540000 | 01003ff7 | 55f06670 | 001c5ec0 | 00000018 |
| 1577240 | 02000a3f | 66c00020 | 00185ec0 | 00000020 | 02000887 | 6b7458e0 | 01003ff7 | 6c84001c | 5c9c0018 | 02000887 | 6d3c58e0 | 01003ff7 |
| 1577320 | 6c344768 | 33bc247c | 000e6a1c | 0018386c | 3d302340 | 000e6a3c | 00000040 | 000e3358 | b27cb66c | 000005a6 | 7fffffff | 000e3524 |
| 1577400 | 02000ce5 | 020031ed | 020031e5 | 000046bf | 02003645 | 0000000c | 00000010 | 01003ff5 | 0000000e | 00002aff | 000e363c | 00000038 |
| 1577460 | b27cb66c | 000005a7 | 000005c1 | 000e3640 | 02000ce5 | 05001b0d | 000046bf | 0000001b | 00002c07 | 007350e3 | 000002cb | 00002aff |
| 1577540 | 27f00044 | 000e3560 | 5d100000 | 03003287 | 4b8c0000 | 000046bf | 64205818 | 67ec001c | 537056f8 | 671c5370 | 5d100000 | 01003ff7 |
| 1577620 | 671c36a4 | 37240018 | 3678001c | 320c22bc | 000cc5cc | 00000044 | 000e3468 | b27cb66c | 000005a8 | 7fffffff | 000e35b4 | 02000ce5 |
| 1577700 | 020031ed | 020031e5 | 000046bf | 02003765 | 0000000c | 00000010 | 01003ff5 | 01003ce5 | 0000000e | 00002aff | 2954004c | 0002438a |

| | | | | | | | | | | | | |
|---|---|---|---|---|---|---|---|---|---|---|---|---|
| 1577760 | 5d100000 | 03003287 | 4b8c0000 | 000046bf | 64205818 | 67ec001c | 53705678 | 671c5370 | 5d100000 | 01003ff7 | 5a180000 | 01003ce7 |
| 1600040 | 671c36a4 | 37240018 | 3678001c | 320c22bc | 000cf1c8 | 0000008c | 000e3524 | b27cb66c | 000005a9 | 7fffffff | 000e3724 | 02000ce5 |
| 1600120 | 020031ed | 020031e5 | 000046c7 | 02000a3d | 0100413d | 0000000c | 02000a3d | 02000885 | 000046bf | 00000010 | 02000885 | 000046c7 |
| 1600200 | 00000014 | 020031f5 | 01003ff5 | 00000001 | 00000018 | 0000001c | 02000a3d | 02000885 | 00000012 | 01003ff5 | 0000001a | 02000885 |
| 1600260 | 00000016 | 01003ff5 | 0000001e | 00002aff | 000e37c8 | 00000038 | b27cb66c | 000005aa | 000005c2 | 000e37cc | 02000ce5 | 05001b0d |
| 1600340 | 000046c7 | 0000001b | 00002c07 | 007351e3 | 000002cb | 00002aff | 27f000ac | 000e3754 | 5d100000 | 03003287 | 4b8c0000 | 000046c7 |
| 1600420 | 60cc56f8 | 671c55f0 | 686855f0 | 69b05370 | 581867b8 | 53705c30 | 020031f7 | 65300018 | 5e540000 | 01003ff7 | 55f06670 | 001c5ec0 |
| 1600500 | 00000018 | 02000a3f | 66c00020 | 00185ec0 | 00000020 | 02000887 | 6e0858e0 | 01003ff7 | 6c84001c | 5c9c0018 | 02000887 | 6d3c58e0 |
| 1600560 | 01003ff7 | 6c344768 | 34a0001c | 364035c8 | 31f0247c | 000d0090 | 002033bc | 3e70001c | 3c480000 | 000e6a1c | 0018386c | 3d302340 |
| 1600640 | 000e6a3c | 00000038 | 000e35b4 | b27cb66c | 000005ab | 7fffffff | 000e378c | 02000ce5 | 020031ed | 020031e5 | 000046c7 | 00000007 |
| 1600720 | 01003ff5 | 00000007 | 00002aff | 2954002e | 0002438a | 5d100000 | 03003287 | 4b8c0000 | 000046c7 | 537055f0 | 671c5370 | 5d100000 |
| 1601000 | 01003ff7 | 53704960 | 228c3789 | 00000040 | 000e3724 | b27cb66c | 000005ac | 7fffffff | 000e3850 | 02000ce5 | 020031ed | 020031e5 |
| 1601060 | 000046b7 | 02003645 | 0000343f | 0000000c | 01003ff5 | 0000343f | 00002aff | 000e3edc | 00000038 | b130b66c | 000005ad | 000005c3 |
| 1601140 | 000e2a4d | 02000ce5 | 05001b0d | 000046b7 | 0000001b | 00002c07 | 00734c83 | 000002cb | 00002aff | 27f0004c | 000e3888 | 5d100000 |
| 1601220 | 03003287 | 4b8c0000 | 000046b7 | 60cc56f8 | 671c5370 | 581867b8 | 53705c30 | 01003ff7 | 4b8c0000 | 0000343f | 36a43724 | 0018362c |
| 1601300 | 320c41d4 | 0000343f | 239c0000 | 000cc5cc | 00000040 | 000e378c | b27cb66c | 000005ae | 7fffffff | 000e38dc | 02000ce5 | 020031ed |
| 1601360 | 020031e5 | 000046b7 | 02003645 | 000033bf | 0000000c | 01003ff5 | 000033bf | 00002aff | 28c4004c | 000e3914 | 5d100000 | 03003287 |
| 1601440 | 4b8c0000 | 000046b7 | 60cc56f8 | 671c5370 | 581867b8 | 53705c30 | 01003ff7 | 4b8c0000 | 000033bf | 36a43724 | 0018362c | 320c41d4 |
| 1601520 | 000033bf | 239c0000 | 000cc5cc | 00000040 | 000e3850 | b27cb66c | 000005af | 7fffffff | 000e3968 | 02000ce5 | 020031ed | 020031e5 |
| 1601600 | 000046b7 | 02003645 | 0000340f | 0000000c | 01003ff5 | 0000340f | 00002aff | 28c4004c | 000e39a0 | 5d100000 | 03003287 | 4b8c0000 |
| 1601660 | 000046b7 | 60cc56f8 | 671c5370 | 581867b8 | 53705c30 | 01003ff7 | 4b8c0000 | 0000340f | 36a43724 | 0018362c | 320c41d4 | 0000340f |
| 1601740 | 239c0000 | 000cc5cc | 00000040 | 000e38dc | b27cb66c | 000005b0 | 7fffffff | 000e39f4 | 02000ce5 | 020031ed | 020031e5 | 000046b7 |
| 1602020 | 02003645 | 000034bf | 0000000c | 01003ff5 | 000034bf | 00002aff | 28c4004c | 000e3a2c | 5d100000 | 03003287 | 4b8c0000 | 000046b7 |
| 1602100 | 60cc56f8 | 671c5370 | 581867b8 | 53705c30 | 01003ff7 | 4b8c0000 | 000034bf | 36a43724 | 0018362c | 320c41d4 | 000034bf | 239c0000 |
| 1602160 | 000cc5cc | 00000040 | 000e3968 | b27cb66c | 000005b1 | 7fffffff | 000e3a80 | 02000ce5 | 020031ed | 020031e5 | 000046b7 | 02003645 |
| 1602240 | 0000344f | 0000000c | 01003ff5 | 0000344f | 00002aff | 28c4004c | 000e3ab8 | 5d100000 | 03003287 | 4b8c0000 | 000046b7 | 60cc56f8 |
| 1602320 | 671c5370 | 581867b8 | 53705c30 | 01003ff7 | 4b8c0000 | 0000344f | 36a43724 | 0018362c | 320c41d4 | 0000344f | 239c0000 | 000cc5cc |
| 1602400 | 00000040 | 000e39f4 | b27cb66c | 000005b2 | 7fffffff | 000e3b0c | 02000ce5 | 020031ed | 020031e5 | 000046b7 | 02003645 | 000034af |
| 1602460 | 0000000c | 01003ff5 | 000034af | 00002aff | 28c4004c | 000e3b44 | 5d100000 | 03003287 | 4b8c0000 | 000046b7 | 60cc56f8 | 671c5370 |
| 1602540 | 581867b8 | 53705c30 | 01003ff7 | 4b8c0000 | 000034af | 36a43724 | 0018362c | 320c41d4 | 000034af | 239c0000 | 000cc5cc | 00000040 |
| 1602620 | 000e3a80 | b27cb66c | 000005b3 | 7fffffff | 000e3b98 | 02000ce5 | 020031ed | 020031e5 | 000046b7 | 02003645 | 0000352f | 0000000c |
| 1602700 | 01003ff5 | 0000352f | 00002aff | 28c4004c | 000e3bd0 | 5d100000 | 03003287 | 4b8c0000 | 000046b7 | 60cc56f8 | 671c5370 | 581867b8 |
| 1602760 | 53705c30 | 01003ff7 | 4b8c0000 | 0000352f | 36a43724 | 0018362c | 320c41d4 | 0000352f | 239c0000 | 000cc5cc | 00000040 | 000e3b0c |
| 1603040 | b27cb66c | 000005b4 | 7fffffff | 000e3c24 | 02000ce5 | 020031ed | 020031e5 | 000046b7 | 02003645 | 0000350f | 0000000c | 01003ff5 |
| 1603120 | 0000350f | 00002aff | 28c4004c | 000e3c5c | 5d100000 | 03003287 | 4b8c0000 | 000046b7 | 60cc56f8 | 671c5370 | 581867b8 | 53705c30 |
| 1603200 | 01003ff7 | 4b8c0000 | 0000350f | 36a43724 | 0018362c | 320c41d4 | 0000350f | 239c0000 | 000cc5cc | 00000040 | 000e3b98 | b27cb66c |
| 1603260 | 000005b5 | 7fffffff | 000e3cb0 | 02000ce5 | 020031ed | 020031e5 | 000046b7 | 02003645 | 00001d77 | 0000000c | 01003ff5 | 00001d77 |
| 1603340 | 00002aff | 28c4004c | 000e3ce8 | 5d100000 | 03003287 | 4b8c0000 | 000046b7 | 60cc56f8 | 671c5370 | 581867b8 | 53705c30 | 01003ff7 |
| 1603420 | 4b8c0000 | 00001d77 | 36a43724 | 0018362c | 320c41d4 | 00001d77 | 239c0000 | 000cc5cc | 00000040 | 000e3c24 | b27cb66c | 000005b6 |
| 1603500 | 7fffffff | 000e3d3c | 02000ce5 | 020031ed | 020031e5 | 000046b7 | 02003645 | 00003507 | 0000000c | 01003ff5 | 00003507 | 00002aff |
| 1603560 | 28c4004c | 000e3d74 | 5d100000 | 03003287 | 4b8c0000 | 000046b7 | 60cc56f8 | 671c5370 | 581867b8 | 53705c30 | 01003ff7 | 4b8c0000 |
| 1603640 | 00003507 | 36a43724 | 0018362c | 320c41d4 | 00003507 | 239c0000 | 000cc5cc | 00000040 | 000e3cb0 | b27cb66c | 000005b7 | 7fffffff |
| 1603720 | 000e3dc8 | 02000ce5 | 020031ed | 020031e5 | 000046b7 | 02003645 | 0000354f | 0000000c | 01003ff5 | 0000354f | 00002aff | 28c4004c |
| 1604000 | 000e3e00 | 5d100000 | 03003287 | 4b8c0000 | 000046b7 | 60cc56f8 | 671c5370 | 581867b8 | 53705c30 | 01003ff7 | 4b8c0000 | 0000354f |
| 1604060 | 36a43724 | 0018362c | 320c41d4 | 0000354f | 239c0000 | 000cc5cc | 00000040 | 000e3d3c | b27cb66c | 000005b8 | 7fffffff | 000e3e54 |
| 1604140 | 02000ce5 | 020031ed | 020031e5 | 000046b7 | 02003645 | 00003407 | 0000000c | 01003ff5 | 00003407 | 00002aff | 28c4004c | 000e3e8c |
| 1604220 | 5d100000 | 03003287 | 4b8c0000 | 000046b7 | 60cc56f8 | 671c5370 | 581867b8 | 53705c30 | 01003ff7 | 4b8c0000 | 00003407 | 36a43724 |
| 1604300 | 0018362c | 320c41d4 | 00003407 | 239c0000 | 000cc5cc | 00000040 | 000e3dc8 | b27cb66c | 000005b9 | 7fffffff | 000c6985 | 02000ce5 |
| 1604360 | 020031ed | 020031e5 | 000046b7 | 02003645 | 000022b7 | 0000000c | 01003ff5 | 000022b7 | 00002aff | 2954004c | 0002438a | 5d100000 |
| 1604440 | 03003287 | 4b8c0000 | 000046b7 | 60cc56f8 | 671c5370 | 581867b8 | 53705c30 | 01003ff7 | 4b8c0000 | 000022b7 | 36a43724 | 0018362c |
| 1604520 | 320c41d4 | 000022b7 | 239c0000 | 000cc5cc | 000e48dc | 00000960 | 02000a57 | 000dff6d | 000dcf95 | 000e3ef5 | 000e3eda | 02000a57 |
| 1604600 | 000dff91 | 000deaf9 | 000e3f09 | 000e3eee | 02000a57 | 000dffb1 | 000deb35 | 000e3f1d | 000e3f02 | 02000a57 | 000dffd5 | 000deb71 |
| 1604660 | 000e3f31 | 000e3f16 | 02000a57 | 000dfff9 | 000debad | 000e3f45 | 000e3f2a | 02000a57 | 000e001d | 000debe9 | 000e3f59 | 000e3f3e |
| 1604740 | 02000a57 | 000e0041 | 000dec25 | 000e3f6d | 000e3f52 | 02000a57 | 000e0065 | 000dec61 | 000e3f81 | 000e3f66 | 02000a57 | 000e0089 |
| 1605020 | 000dec9d | 000e3f95 | 000e3f7a | 02000a57 | 000e00ad | 000decd9 | 000e3fa9 | 000e3f8e | 02000a57 | 000e00d1 | 000ded15 | 000e3fbd |

| | | | | | | | | | | | | |
|---|---|---|---|---|---|---|---|---|---|---|---|---|
| 1605160 | 0000001b | 01002647 | 0000005b | 0000000b | 000e3fed | 02000a57 | 000ded3d | 000dd085 | 00000013 | 000e3fed | 00000013 | 000e4019 |
| 1605240 | 01002647 | 00000063 | 0200166f | fffffffb | 00000003 | 0200166f | fffffffb | 00000003 | 00000013 | 000e4042 | 0000001b | 000e4019 |
| 1605320 | 00000013 | 000e4052 | 0000001b | 000e4059 | 01002647 | 0000006b | 0200166f | fffffffb | 00000003 | 0200166f | fffffffb | 00000003 |
| 1605400 | 00000013 | 000e4082 | 0000001b | 000e408a | 00000023 | 000e4059 | 00000013 | 000e409a | 0000001b | 000e4059 | 0200166f | fffffffb |
| 1605460 | 00000003 | 0200166f | fffffffb | 00000003 | 00000013 | 000e40c2 | 0000001b | 000e40ca | 0000002b | 000e4059 | 00000013 | 000e40da |
| 1605540 | 0000001b | 000e4059 | 0200166f | fffffffb | 00000003 | 0200166f | fffffffb | 00000003 | 00000013 | 000e4102 | 0000001b | 000e410a |
| 1605620 | 00000033 | 000e4059 | 00000013 | 000e411a | 0000001b | 000e4059 | 0200166f | fffffffb | 00000003 | 0200166f | fffffffb | 00000003 |
| 1605700 | 00000013 | 000e4142 | 0000001b | 000e414a | 0000003b | 000e4059 | 00000013 | 000e415a | 0000001b | 000e4162 | 0000003b | 000e416a |
| 1605760 | 00000043 | 000e4059 | 00000013 | 000e417a | 0000001b | 000e4182 | 0000003b | 000e4059 | 0200166f | fffffffb | 00000003 | 0200166f |
| 1606040 | fffffffb | 00000003 | 00000013 | 000e41aa | 0000001b | 000e41b2 | 0000003b | 000e41ba | 0000004b | 000e4059 | 00000013 | 000e41ca |
| 1606120 | 0000001b | 000e41d2 | 0000003b | 000e4059 | 0200166f | fffffffb | 00000003 | 0200166f | fffffffb | 00000003 | 00000013 | 000e41fa |
| 1606200 | 0000001b | 000e4202 | 0000003b | 000e420a | 00000053 | 000e4059 | 00000013 | 000e421a | 0000001b | 000e4222 | 0000003b | 000e4059 |
| 1606260 | 0200166f | fffffffb | 00000003 | 0200166f | fffffffb | 00000003 | 00000013 | 000e424a | 0000001b | 000e4252 | 0000003b | 000e425a |
| 1606340 | 00000053 | 000e4059 | 00000013 | 000e4252 | 00000013 | 000e4272 | 0000003b | 000e427a | 0000004b | 000e425a | 0200166f | fffffffb |
| 1606420 | 00000003 | 0200166f | fffffffb | 00000003 | 0200166f | fffffffb | 00000003 | 0200166f | fffffffb | 00000003 | 0200166f | fffffffb |
| 1606500 | 00000003 | 0200166f | fffffffb | 00000003 | 00000053 | 000e4059 | 0200166f | fffffffb | 00000003 | 0200166f | fffffffb | 00000003 |
| 1606560 | 01002647 | 00000073 | 0200166f | fffffffb | 00000003 | 0200166f | fffffffb | 00000003 | 01002647 | 0000007b | 0200166f | fffffffb |
| 1606640 | 00000003 | 0200166f | fffffffb | 00000003 | 01002647 | 00000083 | 0200166f | fffffffb | 00000003 | 0200166f | fffffffb | 00000003 |
| 1606720 | 01002647 | 0000008b | 0200166f | fffffffb | 00000003 | 0200166f | fffffffb | 00000003 | 01002647 | 00000083 | 0000004b | 000e4369 |
| 1607000 | 0200166f | fffffffb | 00000003 | 0200166f | fffffffb | 00000003 | 0000006b | 000e4369 | 0000004b | 000e4392 | 0200166f | fffffffb |
| 1607060 | 00000003 | 0200166f | fffffffb | 00000003 | 0200166f | fffffffb | 00000003 | 0200166f | fffffffb | 00000003 | 01002647 | 0000008b |
| 1607140 | 0200166f | fffffffb | 00000003 | 0200166f | fffffffb | 00000003 | 01002647 | 00000093 | 0200166f | fffffffb | 00000003 | 0200166f |
| 1607220 | fffffffb | 00000003 | 01002647 | 0000008b | 01002647 | 00000093 | 0200166f | fffffffb | 00000003 | 0200166f | fffffffb | 00000003 |
| 1607300 | 00000073 | 000e4419 | 0200166f | fffffffb | 00000003 | 0200166f | fffffffb | 00000003 | 01002647 | 0000009b | 0200166f | fffffffb |
| 1607360 | 00000003 | 0200166f | fffffffb | 00000003 | 00000073 | 000e4459 | 00000073 | 000e4489 | 01002647 | 00000093 | 0200166f | fffffffb |
| 1607440 | 00000003 | 0200166f | fffffffb | 00000003 | 01002647 | 0000008b | 00000073 | 000e44a9 | 0200166f | fffffffb | 00000003 | 0200166f |
| 1607520 | fffffffb | 00000003 | 0000004b | 000e44a9 | 0000004b | 000e44e2 | 00000073 | 000e44a9 | 0200166f | fffffffb | 00000003 | 0200166f |
| 1607600 | fffffffb | 00000003 | 00000073 | 000e4509 | 01002647 | 00000083 | 00000063 | 000e4502 | 0200166f | fffffffb | 00000003 | 0200166f |
| 1607660 | fffffffb | 00000003 | 0000004b | 000e4502 | 0000004b | 000e4542 | 00000063 | 000e4502 | 0200166f | fffffffb | 00000003 | 0200166f |
| 1607740 | fffffffb | 00000003 | 00000063 | 000e456a | 00000073 | 000e4571 | 01002647 | 0000007b | 0000005b | 000e4562 | 0200166f | fffffffb |
| 1610020 | 00000003 | 0200166f | fffffffb | 00000003 | 0000004b | 000e4562 | 0000004b | 000e45aa | 0000005b | 000e4562 | 0200166f | fffffffb |
| 1610100 | 00000003 | 0200166f | fffffffb | 00000003 | 0000000b | 000e45aa | 0000000b | 000e45da | 0000005b | 000e45e2 | 00000063 | 000e45ea |
| 1610160 | 0000006b | 000e456a | 02000a57 | 000ded3d | 000dd085 | 00000023 | 000e45da | 0000000b | 000e45fe | 02000a57 | 000ded3d | 000dd085 |
| 1610240 | 00000023 | 000e4622 | 0000004b | 000e45da | 0000000b | 000e461a | 02000a57 | 000ded3d | 000dd085 | 00000023 | 000e4646 | 0000003b |
| 1610320 | 000e4622 | 0200166f | fffffffb | 00000003 | 0200166f | fffffffb | 00000003 | 0200166f | fffffffb | 00000003 | 0200166f | fffffffb |
| 1610400 | 00000003 | 00000023 | 000e4622 | 0200166f | fffffffb | 00000003 | 0200166f | fffffffb | 00000003 | 0000000b | 000e4622 | 0000000b |
| 1610460 | 000e46ae | 00000023 | 000e4622 | 02000a57 | 000ded3d | 000dd085 | 0200166f | fffffffb | 00000003 | 0200166f | fffffffb | 00000003 |
| 1610540 | 00000033 | 000e4622 | 0200166f | fffffffb | 00000003 | 0200166f | fffffffb | 00000003 | 00000033 | 000e4622 | 00000033 | 000e470a |
| 1610620 | 0000003b | 000e4622 | 0200166f | fffffffb | 00000003 | 0200166f | fffffffb | 00000003 | 0000002b | 000e470a | 0200166f | fffffffb |
| 1610700 | 00000003 | 0200166f | fffffffb | 00000003 | 00000033 | 000e470a | 0000002b | 000e474a | 0200166f | fffffffb | 00000003 | 0200166f |
| 1610760 | fffffffb | 00000003 | 00000023 | 000e474a | 00000023 | 000e4782 | 0000002b | 000e474a | 0200166f | fffffffb | 00000003 | 0200166f |
| 1611040 | fffffffb | 00000003 | 0000000b | 000e4782 | 0000000b | 000e47b2 | 00000023 | 000e4782 | 02000a57 | 000ded3d | 000dd085 | 00000023 |
| 1611120 | 000e47ce | 0000002b | 000e47d6 | 00000033 | 000e47de | 0000003b | 000e47e6 | 0000004b | 000e47ee | 00000053 | 000e45da | 0200166f |
| 1611200 | fffffffb | 00000003 | 0200166f | fffffffb | 00000003 | 0000000b | 000e47ce | 0000000b | 000e481e | 00000023 | 000e47ce | 02000a57 |
| 1611260 | 000ded3d | 000dd085 | 0000000b | 000e481e | 2cac0a57 | 0002438a | 2ca0d085 | 00000000 | 00000001 | 000e0894 | 000e0894 | 0002438a |
| 1611340 | 000e282c | 2cac003b | 0002438a | 2ca00043 | 00000000 | 00000001 | 000e0abc | 000e0abc | 0002438a | 000e2828 | 2cac0003 | 0002438a |
| 1611420 | 2ca0484e | 00000000 | 00000001 | 000e0c8c | 000e0c8c | 0002438a | 000e48a4 | 000e0c98 | 0011656e | 74697479 | 5f646573 | 69676e61 |
| 1611500 | 746f7200 | 00117269 | 67697420 | 70617265 | 6e746865 | 73697300 | 000e2d84 | 000e2a7c | 000e49d8 | 0000002c | b288b66c | 000005c4 |
| 1611560 | 7fffffff | 000da100 | 02000ce5 | 0100147d | 01002d65 | 0000000b | 00002aff | 002c2f68 | 6f6d652f | 6f736173 | 312f612f | 73726565 |
| 1611640 | 2f73656d | 616e7469 | 635f6369 | 65636b31 | 2f746572 | 6d696e61 | 6c730020 | 002f2f68 | 6f6d652f | 6f736173 | 312f612f | 73726565 |
| 1611720 | 2f73656d | 616e7469 | 635f6368 | 65636b31 | 2f746572 | 6d696e61 | 6c732e70 | 6c00292c | 0000002c | 000e6d44 | b27cb66c | 000005c6 |
| 1612000 | 7fffffff | 000e28c8 | 02000ce5 | 0200293d | 000046e7 | 000002d3 | 00002aff | 0000002c | 000b96a0 | b27cb66c | 000005f9 | 7fffffff |
| 1612060 | 000e28f4 | 02000ce5 | 02001f6d | 000046e7 | 00002c07 | 00002aff | 000e7479 | 70655f73 | 656d616e | 74696373 | 00000000 | 000e4b50 |
| 1612140 | 000000c8 | b27cb66c | 000005c8 | 000005f8 | 0009cbc1 | 02000ce5 | 02002385 | 000046e7 | 00002c07 | 00002aff | 000e4a3c | 00000038 |

| | | | | | | | | | | | | |
|---|---|---|---|---|---|---|---|---|---|---|---|---|
| 1612220 | b27cb66c | 000005c9 | 000005fa | 000e4a6c | 02000ce5 | 05001b0d | 000046ef | 00000013 | 00002c07 | 007352e3 | 000002d3 | 00002aff |
| 1612300 | 000e4a68 | 0000002c | b4f0b4e4 | 000005c8 | 7fffffff | 0007eaad | 00000000 | 00000000 | 000e6254 | 0002438a | 000e9124 | 000e4b50 |
| 1612360 | 00000038 | b27cb66c | 000005ca | 000005fb | 000e4b54 | 02000ce5 | 05001b0d | 000046f7 | 0000000b | 00002c07 | 007465e3 | 000002d3 |
| 1612440 | 00002aff | 2c780054 | 0002438a | 5d100000 | 020046ef | 68406960 | 2e7cadec | 2ba00018 | 001437dc | 3ba00000 | 000e6a5c | 0018aa50 |
| 1612520 | 2e9822a0 | 2c5843e4 | 020046ef | 6d806d3c | 447c0000 | 02000cdf | 4b8c0000 | 00002c07 | 6bb4234c | 0007ebcc | 0000005c | 000a92b0 |
| 1612600 | b27cb66c | 000005cb | 7fffffff | 000e4bf4 | 02000ce5 | 020031e5 | 02003645 | 0000000c | 00000010 | 02000a3d | 00000001 | 02003645 |
| 1612660 | 0000000e | 00000012 | 00000007 | 01002d65 | 010046f5 | 020046ed | 0000000e | 00000012 | 00002aff | 000e4c44 | 00000038 | b27cb66c |
| 1612740 | 000005cc | 000005fc | 000e4c48 | 02000ce5 | 05001b0d | 00003647 | 0000002b | 00002c07 | 00662e63 | 000002d3 | 00002aff | 2c780068 |
| 1613020 | 0002438a | 36f4001c | 5de90000 | 03003287 | 62c05370 | 5de80000 | 02003647 | 6c48001c | 6b8856f8 | 671c5370 | 56f8671c | 53705aec |
| 1613100 | 02003647 | 6c48001c | 6b88359c | 56f8671c | 6c480018 | 5d100000 | 02003647 | 6c48001c | 6b8843c0 | 020046ef | 6c48001c | 6b8822bc |
| 1613160 | 000e8cbc | 00000054 | 000e4af8 | b27cb66c | 000005cd | 7fffffff | 000e4cec | 02000ce5 | 020031e5 | 010036d5 | 0000000c | 02000a3d |
| 1613240 | 00000001 | 010036d5 | 0000000e | 00000007 | 01002d65 | 010046f5 | 020046ed | 000046ff | 0000000e | 00002aff | 000e4d3c | 00000038 |
| 1613320 | b27cb66c | 000005ce | 000005fd | 000e4d40 | 02000ce5 | 05001b0d | 000036d7 | 00000023 | 00002c07 | 006784c3 | 000002d3 | 00002aff |
| 1613400 | 2c78006c | 0002438a | 36f40018 | 5d7c0000 | 03003287 | 61605370 | 5d7c0000 | 010036d7 | 6c480018 | 56f8671c | 537056f8 | 671c5370 |
| 1613460 | 5d100000 | 010036d7 | 6c480018 | 358856f8 | 671c6c08 | 5d100000 | 010036d7 | 6c480018 | 447c0000 | 020046ef | 4b8c0000 | 000046ff |
| 1613540 | 6c480018 | 239c0000 | 000e8cbc | 00000054 | 000e4bf4 | b27cb66c | 000005cf | 7fffffff | 000e4de4 | 02000ce5 | 020031e5 | 010036dd |
| 1613620 | 0000000c | 02000a3d | 00000001 | 010036dd | 0000000e | 00000007 | 01002d65 | 010046f5 | 020046ed | 00004707 | 0000000e | 00002aff |
| 1613700 | 000e4e3c | 00000038 | b27cb66c | 000005d0 | 000005fe | 000e4e40 | 02000ce5 | 05001b0d | 000036df | 00000023 | 00002c07 | 006786c3 |
| 1613760 | 000002d3 | 00002aff | 2c78006c | 0002438a | 36f40018 | 5d7c0000 | 03003287 | 61605370 | 5d7c0000 | 010036df | 6c480018 | 56f8671c |
| 1614040 | 537056f8 | 671c5370 | 5d100000 | 010036df | 6c480018 | 358856f8 | 671c6c08 | 5d100000 | 010036df | 6c480018 | 447c0000 | 020046ef |
| 1614120 | 4b8c0000 | 00004707 | 6c480018 | 239c0000 | 000e8cbc | 0000005c | 000e4cec | b27cb66c | 000005d1 | 7fffffff | 000e4ee0 | 02000ce5 |
| 1614200 | 020031e5 | 02003765 | 0000000c | 00000010 | 02000a3d | 00000001 | 02003765 | 0000000e | 00000012 | 00000007 | 01002d65 | 010046f5 |
| 1614260 | 020046ed | 000029e7 | 00000012 | 00002aff | 000e4f30 | 00000038 | b27cb66c | 000005d2 | 000005ff | 000e4f34 | 02000ce5 | 05001b0d |
| 1614340 | 00003767 | 0000002b | 00002c07 | 00678c43 | 000002d3 | 00002aff | 2c780068 | 0002438a | 5de80000 | 03003287 | 6620001c | 53705ec0 |
| 1614420 | 0000001c | 02003767 | 6b486b88 | 57b86784 | 537057b8 | 67845370 | 5de80000 | 02003767 | 6b486b88 | 366457b8 | 67846c48 | 00185bc4 |
| 1614500 | 02003767 | 6b486b88 | 447c0000 | 020046ef | 4b8c0000 | 000029e7 | 6b8822bc | 000e8cbc | 00000054 | 000e4de4 | b27cb66c | 000005d3 |
| 1614560 | 7fffffff | 000e4fd8 | 02000ce5 | 020031e5 | 010040b5 | 0000000c | 02000a3d | 00000001 | 0100371d | 0000000e | 00000007 | 01002d65 |
| 1614640 | 010046f5 | 020046ed | 0000371f | 0000000e | 00002aff | 000e5028 | 00000038 | b27cb66c | 000005d4 | 00000600 | 000e502c | 02000ce5 |
| 1614720 | 05001b0d | 000040b7 | 00000023 | 00002c07 | 0067cc83 | 000002d3 | 00002aff | 2c78006c | 0002438a | 36f40018 | 5d7c0000 | 03003287 |
| 1615000 | 61605370 | 5d7c0000 | 010040b7 | 6c480018 | 56f8671c | 537056f8 | 671c5370 | 5d100000 | 0100371f | 6c480018 | 358856f8 | 671c6c08 |
| 1615060 | 5d100000 | 0100371f | 6c480018 | 447c0000 | 020046ef | 4b8c0000 | 0000371f | 6c480018 | 239c0000 | 000e8cbc | 00000054 | 000e4ee0 |
| 1615140 | b27cb66c | 000005d5 | 7fffffff | 000e50d0 | 02000ce5 | 020031e5 | 010040dd | 0000000c | 02000a3d | 00000001 | 01003715 | 0000000e |
| 1615220 | 00000007 | 01002d65 | 010046f5 | 020046ed | 00003717 | 0000000e | 00002aff | 000e5120 | 00000038 | b27cb66c | 000005d6 | 00000601 |
| 1615300 | 000e5164 | 02000ce5 | 05001b0d | 000040df | 00000023 | 00002c07 | 0067dba3 | 000002d3 | 00002aff | 2c78006c | 0002438a | 36f40018 |
| 1615360 | 5d7c0000 | 03003287 | 61605370 | 5d7c0000 | 010040df | 6c480018 | 56f8671c | 537056f8 | 671c5370 | 5d100000 | 01003717 | 6c480018 |
| 1615440 | 358856f8 | 671c6c08 | 5d100000 | 01003717 | 6c480018 | 447c0000 | 020046ef | 4b8c0000 | 00003717 | 6c480018 | 239c0000 | 000e8cbc |
| 1615520 | 00000054 | 000e4fd8 | b27cb66c | 000005d7 | 7fffffff | 000e5248 | 02000ce5 | 020031e5 | 0100413d | 0000000c | 02000a3d | 00000001 |
| 1615600 | 010036f5 | 0000000e | 00000007 | 01002d65 | 010046f5 | 020046ed | 000036f7 | 0000000e | 00002aff | 000e5160 | 00000038 | b27cb66c |
| 1615660 | 000005e8 | 0000060a | 000e5c2c | 02000ce5 | 05001b0d | 0000374f | 0000004b | 00002c07 | 006bf8a3 | 000002d3 | 00002aff | 000e8db0 |
| 1615740 | 00000000 | 000e52a8 | 00000078 | b27cb66c | 000005d8 | 00000602 | 000e52ac | 02000ce5 | 05001b0d | 0000413f | 00000023 | 00002c07 |
| 1616020 | 00680483 | 000002d3 | 00002aff | 000e52a8 | 00000040 | 000e8de0 | 00000000 | 00000000 | 00000000 | 000e8d80 | 000dafd5 | 000dad6c |
| 1616100 | 000e8e98 | 000e8d00 | 000da121 | 000e8e81 | 000da6bc | 000db1f5 | 000e8eb8 | 2c78006c | 0002438a | 36f40018 | 5d7c0000 | 03003287 |
| 1616160 | 61605370 | 5d7c0000 | 0100413f | 6c480018 | 56f8671c | 537056f8 | 671c5370 | 5d100000 | 010036f7 | 6c480018 | 358856f8 | 671c6c08 |
| 1616240 | 5d100000 | 010036f7 | 6c480018 | 447c0000 | 020046ef | 4b8c0000 | 000036f7 | 6c480018 | 239c0000 | 000e8cbc | 00000064 | 000e50d0 |
| 1616320 | b27cb66c | 000005d9 | 7fffffff | 000e5358 | 02000ce5 | 020031e5 | 03003695 | 0000000c | 00000010 | 00000014 | 02000a3d | 00000001 |
| 1616400 | 03003695 | 0000000e | 00000012 | 00000016 | 00000007 | 01002d65 | 010046f5 | 020046ed | 0000000e | 00000016 | 00002aff | 000e53b8 |
| 1616460 | 00000038 | b27cb66c | 000005da | 00000603 | 000e53bc | 02000ce5 | 05001b0d | 00003697 | 00000033 | 00002c07 | 006ba403 | 000002d3 |
| 1616540 | 00002aff | 2c780074 | 0002438a | 36f40020 | 5e540000 | 03003287 | 64205370 | 5e540000 | 03003697 | 6c480020 | 6b886bc8 | 56f8671c |
| 1616620 | 537056f8 | 671c5370 | 5d100000 | 03003697 | 6c480020 | 6b886bc8 | 35b00018 | 56f8671c | 6c48001c | 5d100000 | 03003697 | 6c480020 |
| 1616700 | 6b886bc8 | 447c0000 | 020046ef | 6c480020 | 6bc822bc | 000e8cbc | 00000064 | 000e5248 | b27cb66c | 000005db | 7fffffff | 000e5468 |
| 1616760 | 02000ce5 | 020031e5 | 03003375 | 0000000c | 00000010 | 00000014 | 02000a3d | 00000001 | 03003375 | 0000000e | 00000012 | 00000016 |
| 1617040 | 00000007 | 01002d65 | 010046f5 | 020046ed | 0000000e | 00000016 | 00002aff | 000e54c8 | 00000038 | b27cb66c | 000005dc | 00000604 |
| 1617120 | 000e54cc | 02000ce5 | 05001b0d | 00003377 | 00000033 | 00002c07 | 006b9bc3 | 000002d3 | 00002aff | 2c780074 | 0002438a | 36f40020 |
| 1617200 | 5e540000 | 03003287 | 64205370 | 5e540000 | 03003377 | 6c480020 | 6b886bc8 | 56f8671c | 537056f8 | 671c5370 | 5d100000 | 03003377 |
| 1617260 | 6c480020 | 6b886bc8 | 35b00018 | 56f8671c | 6c48001c | 5d100000 | 03003377 | 6c480020 | 6b886bc8 | 447c0000 | 020046ef | 6c480020 |

| | | | | | | | | | | | | |
|---|---|---|---|---|---|---|---|---|---|---|---|---|
| 1617420 | 00000010 | 00000014 | 02000a3d | 00000001 | 030036bd | 0000000e | 00000012 | 00000016 | 00000007 | 01002d65 | 010046f5 | 020046ed |
| 1617500 | 0000000e | 00000016 | 00002aff | 000e55d8 | 00000038 | b27cb66c | 000005de | 00000605 | 000e55dc | 02000ce5 | 05001b0d | 000036bf |
| 1617560 | 00000033 | 00002c07 | 006bbf83 | 000002d3 | 00002aff | 2c780074 | 0002438a | 36f40020 | 5e540000 | 03003287 | 64205370 | 5e540000 |
| 1617640 | 030036bf | 6c480020 | 6b886bc8 | 56f8671c | 537056f8 | 671c5370 | 5d100000 | 030036bf | 6c480020 | 6b886bc8 | 35b00018 | 56f8671c |
| 1617720 | 6c48001c | 5d100000 | 030036bf | 6c480020 | 6b886bc8 | 447c0000 | 020046ef | 6c480020 | 6bc822bc | 000e8cbc | 00000064 | 000e5468 |
| 1620000 | b27cb66c | 000005df | 7fffffff | 000e5688 | 02000ce5 | 020031e5 | 03003385 | 0000000c | 00000010 | 00000014 | 02000a3d | 00000001 |
| 1620060 | 03003385 | 0000000e | 00000012 | 00000016 | 00000007 | 01002d65 | 010046f5 | 020046ed | 0000000e | 00000016 | 00002aff | 000e56e8 |
| 1620140 | 00000038 | b27cb66c | 000005e0 | 00000606 | 000e56ec | 02000ce5 | 05001b0d | 00003387 | 00000033 | 00002c07 | 006bd903 | 000002d3 |
| 1620220 | 00002aff | 2c780074 | 0002438a | 36f40020 | 5e540000 | 03003287 | 64205370 | 5e540000 | 03003387 | 6c480020 | 6b886bc8 | 56f8671c |
| 1620300 | 537056f8 | 671c5370 | 5d100000 | 03003387 | 6c480020 | 6b886bc8 | 35b00018 | 56f8671c | 6c48001c | 5d100000 | 03003387 | 6c480020 |
| 1620360 | 6b886bc8 | 447c0000 | 020046ef | 6c480020 | 6bc822bc | 000e8cbc | 00000064 | 000e5578 | b27cb66c | 000005e1 | 7fffffff | 000e5798 |
| 1620440 | 02000ce5 | 020031e5 | 03003365 | 0000000c | 00000010 | 00000014 | 02000a3d | 00000001 | 03003365 | 0000000e | 00000012 | 00000016 |
| 1620520 | 00000007 | 01002d65 | 010046f5 | 020046ed | 0000000e | 00000016 | 00002aff | 000e57e8 | 00000038 | b27cb66c | 000005e2 | 00000607 |
| 1620600 | 000e57ec | 02000ce5 | 05001b0d | 00003367 | 00000033 | 00002c07 | 006bd363 | 000002d3 | 00002aff | 2c780074 | 0002438a | 36f40020 |
| 1620660 | 5e540000 | 03003287 | 64205370 | 5e540000 | 03003367 | 6c480020 | 6b886bc8 | 56f8671c | 537056f8 | 671c5370 | 5d100000 | 03003367 |
| 1620740 | 6c480020 | 6b886bc8 | 35b00018 | 56f8671c | 6c48001c | 5d100000 | 03003367 | 6c480020 | 6b886bc8 | 447c0000 | 020046ef | 6c480020 |
| 1621020 | 6bc822bc | 000e8cbc | 00000054 | 000e5688 | b27cb66c | 000005e3 | 7fffffff | 000e5890 | 02000ce5 | 020031e5 | 010036cd | 0000000c |
| 1621100 | 02000a3d | 00000001 | 010036cd | 0000000e | 00000007 | 01002d65 | 010046f5 | 020046ed | 000036cf | 0000000e | 00002aff | 000e58e0 |
| 1621160 | 00000038 | b27cb66c | 000005e4 | 00000608 | 000e58e4 | 02000ce5 | 05001b0d | 000036cf | 00000023 | 00002c07 | 006bce03 | 000002d3 |
| 1621240 | 00002aff | 2c78006c | 0002438a | 36f40018 | 5d7c0000 | 03003287 | 61605370 | 5d7c0000 | 010036cf | 6c480018 | 56f8671c | 537056f8 |
| 1621320 | 671c5370 | 5d100000 | 010036cf | 6c480018 | 358856f8 | 671c6c08 | 5d100000 | 010036cf | 6c480018 | 447c0000 | 020046ef | 4b8c0000 |
| 1621400 | 000036cf | 6c480018 | 239c0000 | 000e8cbc | 00000054 | 000e5798 | b27cb66c | 000005e5 | 7fffffff | 000e5988 | 02000ce5 | 020031e5 |
| 1621460 | 0100367d | 0000000c | 02000a3d | 00000001 | 0100367d | 0000000e | 00000007 | 01002d65 | 010046f5 | 020046ed | 0000367f | 0000000e |
| 1621540 | 00002aff | 000e5a80 | 00000038 | b27cb66c | 000005e6 | 00000609 | 000e5124 | 02000ce5 | 05001b0d | 0000367f | 00000023 | 00002c07 |
| 1621620 | 006bf363 | 000002d3 | 00002aff | 2c78006c | 0002438a | 36f40018 | 5d7c0000 | 03003287 | 61605370 | 5d7c0000 | 0100367f | 6c480018 |
| 1621700 | 56f8671c | 537056f8 | 671c5370 | 5d100000 | 0100367f | 6c480018 | 358856f8 | 671c6c08 | 5d100000 | 0100367f | 6c480018 | 447c0000 |
| 1621760 | 020046ef | 4b8c0000 | 0000367f | 6c480018 | 239c0000 | 000e8cbc | 0000007c | 000e5890 | b27cb66c | 000005e7 | 7fffffff | 000e5ba8 |
| 1622040 | 02000ce5 | 020031e5 | 0600374d | 0000000c | 00000010 | 00000014 | 00000018 | 0000001c | 00000020 | 02000a3d | 00000001 | 0600374d |
| 1622120 | 0000000e | 00000012 | 00000016 | 0000001a | 0000001e | 00000022 | 00000007 | 01002d65 | 010046f5 | 020046ed | 0000470f | 00000022 |
| 1622200 | 00002aff | 000e8f9c | 000e8f28 | 000d04dc | 000db1e4 | 00000000 | 00000000 | 00000000 | 000be0cd | 000db1f5 | 000e8ec8 | 000e8f5c |
| 1622260 | 00000000 | 000e8e61 | 00000000 | 000e8df0 | 000e8ea8 | 000e8e30 | 000e8f7c | 000e8dd0 | 00000000 | 00000000 | 00000000 | 000e8ff5 |
| 1622340 | 000e8e10 | 00000000 | 000e8e88 | 000e8cf0 | 000da905 | 00000000 | 00000000 | 00000000 | 00000000 | 000e5c28 | 00000080 | 00000000 |
| 1622420 | 00000000 | 00000000 | 00000000 | 00000000 | 000da129 | 000e8f08 | 000e8ed8 | 000e8f6c | 00000000 | 000e8e68 | 00000000 | 000e8e00 |
| 1622500 | 000e8eb8 | 000e8e40 | 000e8f8c | 000e8de0 | 00000000 | 00000000 | 00000000 | 000e8ffc | 000e8e20 | 00000000 | 000e8e98 | 00000000 |
| 1622560 | 00000000 | 00000000 | 00000000 | 00000000 | 00000000 | 2c7800a4 | 0002438a | 5c9c0020 | 03003287 | 66c0002c | 00205370 | 5c9c002c |
| 1622640 | 0600374f | 6b486b88 | 6bc86c08 | 6c480018 | 6c48001c | 58780020 | 67ec0020 | 53705878 | 002067ec | 00205370 | 5c9c0020 | 0600374f |
| 1622720 | 6b486b88 | 6bc86c08 | 6c480018 | 6c48001c | 37540020 | 00245878 | 002067ec | 00206c48 | 00285ec0 | 00000020 | 0600374f | 6b486b88 |
| 1623000 | 6bc86c08 | 6c480018 | 6c48001c | 447c0000 | 020046ef | 4b8c0000 | 0000470f | 6c48001c | 239c0000 | 000e8cbc | 00000084 | 000e5988 |
| 1623060 | b27cb66c | 000005e9 | 7fffffff | 000e5d14 | 02000ce5 | 020031e5 | 07003745 | 0000000c | 00000010 | 00000014 | 00000018 | 0000001c |
| 1623140 | 00000020 | 00000024 | 02000a3d | 00000001 | 07003745 | 0000000e | 00000012 | 00000016 | 0000001a | 0000001e | 00000022 | 00000026 |
| 1623220 | 00000007 | 01002d65 | 010046f5 | 020046ed | 00004717 | 00000026 | 00002aff | 000e5d74 | 00000038 | b27cb66c | 000005ea | 0000060b |
| 1623300 | 000e5d78 | 02000ce5 | 05001b0d | 00003747 | 00000053 | 00002c07 | 006bfb43 | 000002d3 | 00002aff | 2c7800b0 | 0002438a | 5c9c0024 |
| 1623360 | 03003287 | 66c00030 | 00245370 | 5c9c0030 | 07003747 | 6b486b88 | 6bc86c08 | 6c480018 | 6c48001c | 6c480020 | 58780024 | 67ec0024 |
| 1623440 | 53705878 | 002467ec | 00245370 | 5c9c0024 | 07003747 | 6b486b88 | 6bc86c08 | 6c480018 | 6c48001c | 6c480020 | 37540024 | 00285878 |
| 1623520 | 002467ec | 00246c48 | 002c5ec0 | 00000024 | 07003747 | 6b486b88 | 6bc86c08 | 6c480018 | 6c48001c | 6c480020 | 447c0000 | 020046ef |
| 1623600 | 4b8c0000 | 00004717 | 6c480020 | 239c0000 | 000e8cbc | 00000064 | 000e5ba8 | b27cb66c | 000005eb | 7fffffff | 000e5e1c | 02000ce5 |
| 1623660 | 020031e5 | 0300380d | 0000000c | 00000010 | 00000014 | 02000a3d | 00000001 | 0300380d | 0000000e | 00000012 | 00000016 | 00000007 |
| 1623740 | 01002d65 | 010046f5 | 020046ed | 0000471f | 00000016 | 00002aff | 000e5e74 | 00000038 | b27cb66c | 000005ec | 0000060c | 000e5e78 |
| 1624020 | 02000ce5 | 05001b0d | 0000380f | 00000031 | 00002c07 | 006bff03 | 000002d3 | 00002aff | 2c78006c | 0002438a | 5e540000 | 03003287 |
| 1624100 | 66700020 | 53705ec0 | 00000020 | 0300380f | 6b486b88 | 6bc85818 | 67b85370 | 581867b8 | 53705c30 | 0300380f | 6b486b88 | 6bc836dc |
| 1624160 | 00185818 | 67b86c48 | 001c5c30 | 0300380f | 6b486b88 | 6bc843c0 | 020046ef | 4b8c0000 | 0000471f | 6bc822bc | 000e8cbc | 0000005c |
| 1624240 | 000e5d14 | b27cb66c | 000005ed | 7fffffff | 000e5f18 | 02000ce5 | 020031e5 | 02003755 | 0000000c | 00000010 | 02000a3d | 00000001 |
| 1624320 | 02003755 | 0000000e | 00000012 | 00000007 | 01002d65 | 010046f5 | 020046ed | 00004727 | 00000012 | 00002aff | 000e5f68 | 00000038 |
| 1624400 | b27cb66c | 000005ee | 0000060d | 000e5f6c | 02000ce5 | 05001b0d | 00003757 | 0000002b | 00002c07 | 006c01e3 | 000002d3 | 00002aff |

| | | | | | | | | | | | | |
|---|---|---|---|---|---|---|---|---|---|---|---|---|
| 1624460 | 2c780068 | 0002438a | 5de80000 | 03003287 | 6620001c | 53705ec0 | 0000001c | 02003757 | 6b486b88 | 57b86784 | 537057b8 | 67845370 |
| 1624540 | 5de80000 | 02003757 | 6b486b88 | 366457b8 | 67846c48 | 00185bc4 | 02003757 | 6b486b88 | 447c0000 | 020046ef | 4b8c0000 | 00004727 |
| 1624620 | 6b8822bc | 000e8cbc | 00000054 | 000e5e1c | b27cb66c | 000005ef | 7fffffff | 000e6010 | 02000ce5 | 020031e5 | 0100368d | 0000000c |
| 1624700 | 02000a3d | 00000001 | 0100368d | 0000000e | 00000007 | 01002d65 | 010046f5 | 020046ed | 00000d07 | 0000000e | 00002aff | 000e6060 |
| 1624760 | 00000038 | b27cb66c | 000005f0 | 0000060e | 000e6064 | 02000ce5 | 05001b0d | 0000368f | 00000023 | 00002c07 | 006d2623 | 000002d3 |
| 1625040 | 00002aff | 2c78006c | 0002438a | 36f40018 | 5d7c0000 | 03003287 | 61605370 | 5d7c0000 | 0100368f | 6c480018 | 56f8671c | 537056f8 |
| 1625120 | 671c5370 | 5d100000 | 0100368f | 6c480018 | 358856f8 | 671c6c08 | 5d100000 | 0100368f | 6c480018 | 447c0000 | 020046ef | 4b8c0000 |
| 1625200 | 00000d07 | 6c480018 | 239c0000 | 000e8cbc | 00000054 | 000e5f18 | b27cb66c | 000005f1 | 7fffffff | 000e6108 | 02000ce5 | 020031e5 |
| 1625260 | 01003705 | 0000000c | 02000a3d | 00000001 | 01003705 | 0000000e | 00000007 | 01002d65 | 010046f5 | 020046ed | 0000000f | 0000000e |
| 1625340 | 00002aff | 000e6158 | 00000038 | b27cb66c | 000005f2 | 0000060f | 000e615c | 02000ce5 | 05001b0d | 00003707 | 00000023 | 00002c07 |
| 1625420 | 006d6663 | 000002d3 | 00002aff | 2c78006c | 0002438a | 36f40018 | 5d7c0000 | 03003287 | 61605370 | 5d7c0000 | 01003707 | 6c480018 |
| 1625500 | 56f8671c | 537056f8 | 671c5370 | 5d100000 | 01003707 | 6c480018 | 358856f8 | 671c6c08 | 5d100000 | 01003707 | 6c480018 | 447c0000 |
| 1625560 | 020046ef | 4b8c0000 | 0000000f | 6c480018 | 239c0000 | 000e8cbc | 00000054 | 000e6010 | b27cb66c | 000005f3 | 7fffffff | 000e6200 |
| 1625640 | 02000ce5 | 020031e5 | 0100373d | 0000000c | 02000a3d | 00000001 | 0100373d | 0000000e | 00000007 | 01002d65 | 010046f5 | 020046ed |
| 1625720 | 00002d6f | 0000000e | 00002aff | 000e6250 | 00000038 | b27cb66c | 000005f4 | 00000610 | 000e6254 | 02000ce5 | 05001b0d | 0000373f |
| 1626000 | 00000023 | 00002c07 | 00506f43 | 000002d3 | 00002aff | 2c78006c | 0002438a | 36f40018 | 5d7c0000 | 03003287 | 61605370 | 5d7c0000 |
| 1626060 | 0100373f | 6c480018 | 56f8671c | 537056f8 | 671c5370 | 5d100000 | 0100373f | 6c480018 | 358856f8 | 671c6c08 | 5d100000 | 0100373f |
| 1626140 | 6c480018 | 447c0000 | 020046ef | 4b8c0000 | 00002d6f | 6c480018 | 239c0000 | 000e8cbc | 00000054 | 000e6108 | b27cb66c | 000005f5 |
| 1626220 | 7fffffff | 000c1625 | 02000ce5 | 020031e5 | 010036b5 | 0000000c | 02000a3d | 00000001 | 010036b5 | 0000000e | 00000007 | 01002d65 |
| 1626300 | 010046f5 | 020046ed | 0000472f | 0000000e | 00002aff | 000e62f4 | 00000038 | b130b66c | 000005f6 | 00000611 | 000e4a41 | 02000ce5 |
| 1626360 | 05001b0d | 000036b7 | 00000023 | 00002c07 | 036ff203 | 000002d3 | 00002aff | 2c78006c | 0002438a | 36f40018 | 5d7c0000 | 03003287 |
| 1626440 | 61605370 | 5d7c0000 | 010036b7 | 6c480018 | 56f8671c | 537056f8 | 671c5370 | 5d100000 | 010036b7 | 6c480018 | 358856f8 | 671c6c08 |
| 1626520 | 5d100000 | 010036b7 | 6c480018 | 447c0000 | 020046ef | 4b8c0000 | 0000472f | 6c480018 | 239c0000 | 000e8cbc | 000e6ca8 | 000005f0 |
| 1626600 | 00000000 | 00000000 | 00000000 | 00000000 | 000e8ffc | 000e8fcc | 000e8f08 | 000e8ed8 | 000e8f6c | 00000000 | 00000000 | 00000000 |
| 1626660 | 00000000 | 00000000 | 000e6ca8 | 000005b0 | 000e632e | 000e5d8d | 000e6336 | 000e5d8d | 000e6336 | 000e5d8d | 000e6336 | 000e635d |
| 1626740 | 000e6336 | 0200088f | 000000a7 | 000e5d85 | 000e635d | 000e6336 | 000e5d3d | 000e636a | 000e5d25 | 000e6372 | 000e5d25 | 000e6372 |
| 1627020 | 000e5d25 | 000e6372 | 000e5ce9 | 000e639a | 000e5cd5 | 000e6392 | 000e5cbd | 000e639a | 000e5cbd | 000e639a | 000e5cbd | 000e639a |
| 1627100 | 000e5c81 | 000e63b2 | 000e5c61 | 000e63ba | 000e5c55 | 000e63c2 | 000e5c55 | 000e63c2 | 000e5c55 | 000e63c2 | 000e5c19 | 000e63da |
| 1627160 | 000e63f1 | 000e63da | 0300088f | 0000007f | 000e5c11 | 000e5c25 | 000e63f1 | 000e63da | 000e5bed | 000e6402 | 000e5bed | 000e6402 |
| 1627240 | 000e5bed | 000e6402 | 000e5bb1 | 000e641a | 000e6431 | 000e641a | 0300088f | 0000007f | 000e5ba9 | 000e5bbd | 000e6431 | 000e641a |
| 1627320 | 000e5b85 | 000e6442 | 000e5b85 | 000e6442 | 000e5b85 | 000e6442 | 000e5b49 | 000e645a | 000e6471 | 000e645a | 0300088f | 0000007f |
| 1627400 | 000e5b41 | 000e5b55 | 000e6471 | 000e645a | 000e5b1d | 000e6482 | 000e5b1d | 000e6482 | 000e5b1d | 000e6482 | 000e5ae1 | 000e649a |
| 1627460 | 000e64b1 | 000e649a | 0300088f | 0000007f | 000e5ad9 | 000e5aed | 000e64b1 | 000e649a | 000e5ab9 | 000e64c2 | 000e5aa1 | 000e64ca |
| 1627540 | 000e5aa1 | 000e64ca | 000e5aa1 | 000e64ca | 000e5a65 | 000e64e2 | 000e64f9 | 000e64e2 | 0300088f | 0000007f | 000e5a5d | 000e5a71 |
| 1627620 | 000e64f9 | 000e64e2 | 000e5a39 | 000e650a | 000e5a39 | 000e650a | 000e5a39 | 000e650a | 000e59fd | 000e6522 | 000e6539 | 000e6522 |
| 1627700 | 0300088f | 0000007f | 000e59f5 | 000e5a09 | 000e6539 | 000e6522 | 000e59d5 | 000e654a | 000e59bd | 000e6552 | 000e59bd | 000e6552 |
| 1627760 | 000e59bd | 000e6552 | 000e5981 | 000e656a | 000e6581 | 000e656a | 0300088f | 0000007f | 000e5979 | 000e598d | 000e6581 | 000e656a |
| 1630040 | 000e5955 | 000e6592 | 000e5955 | 000e6592 | 000e5955 | 000e6592 | 000e5919 | 000e65aa | 000e65c1 | 000e65aa | 0300088f | 0000007f |
| 1630120 | 000e5911 | 000e5925 | 000e65c1 | 000e65aa | 000e58ed | 000e65d2 | 000e58ed | 000e65d2 | 000e58ed | 000e65d2 | 000e58b1 | 000e65ea |
| 1630200 | 000e6601 | 000e65ea | 0300088f | 0000007f | 000e58a9 | 000e58bd | 000e6601 | 000e65ea | 000e5885 | 000e6612 | 000e5885 | 000e6612 |
| 1630260 | 000e5885 | 000e6612 | 000e5849 | 000e662a | 000e6641 | 000e662a | 0300088f | 0000007f | 000e5841 | 000e5955 | 000e6641 | 000e662a |
| 1630340 | 000e581d | 000e6652 | 000e581d | 000e6652 | 000e581d | 000e6652 | 000e57e1 | 000e666a | 000e57cd | 000e6672 | 000e57b5 | 000e667a |
| 1630420 | 000e57b5 | 000e667a | 000e57b5 | 000e667a | 000e5779 | 000e6692 | 000e5765 | 000e669a | 000e574d | 000e66a2 | 000e574d | 000e66a2 |
| 1630500 | 000e574d | 000e66a2 | 000e5711 | 000e66ba | 000e66d1 | 000e66ba | 0300088f | 0000007f | 000e5709 | 000e571d | 000e66d1 | 000e66ba |
| 1630560 | 000e56e5 | 000e66e2 | 000e56e5 | 000e66e2 | 000e56e5 | 000e66e2 | 000e56a9 | 000e66fa | 000e5695 | 000e6702 | 000e567d | 000e670a |
| 1630640 | 000e567d | 000e670a | 000e567d | 000e670a | 000e5641 | 000e6722 | 000e562d | 000e672a | 000e5615 | 000e6732 | 000e5615 | 000e6732 |
| 1630720 | 000e5615 | 000e6732 | 000e6759 | 000e6732 | 0200088f | 000000a7 | 000e560d | 000e6759 | 000e6732 | 000e55c5 | 000e6766 | 000e55ad |
| 1631000 | 000e676e | 000e55ad | 000e676e | 000e55ad | 000e676e | 000e5571 | 000e6786 | 000e555d | 000e678e | 000e5545 | 000e6796 | 000e5545 |
| 1631060 | 000e6796 | 000e5545 | 000e6796 | 000e5509 | 000e67ae | 000e67c5 | 000e67ae | 0300088f | 0000007f | 000e5501 | 000e5515 | 000e67c5 |
| 1631140 | 000e67ae | 000e54dd | 000e67d6 | 000e54dd | 000e67d6 | 000e54dd | 000e67d6 | 000e54a1 | 000e67ee | 000e6805 | 000e67ee | 0300088f |
| 1631220 | 0000007f | 000e5499 | 000e54ad | 000e6805 | 000e67ee | 000e5475 | 000e6816 | 000e5475 | 000e6816 | 000e5475 | 000e6816 | 000e5439 |
| 1631300 | 000e682e | 000e6845 | 000e682e | 0300088f | 0000007f | 000e5431 | 000e5445 | 000e6845 | 000e682e | 000e540d | 000e6856 | 000e540d |
| 1631360 | 000e6856 | 000e540d | 000e6856 | 000e53d1 | 000e686e | 000e53b9 | 000e6876 | 000e53b9 | 000e6876 | 000e53b9 | 000e6876 | 000e537d |
| 1631440 | 000e688e | 000e68a5 | 000e688e | 0300088f | 0000007f | 000e5375 | 000e5389 | 000e68a5 | 000e688e | 000e5351 | 000e68b6 | 000e5351 |
| 1631520 | 000e68b6 | 000e5351 | 000e68b6 | 000e5321 | 000e68ce | 000e530d | 2cac68d6 | 0002438a | 2ca068de | 00000000 | 00000001 | 000e2a70 |

| | | | | | | | | | | | | |
|---|---|---|---|---|---|---|---|---|---|---|---|---|
| 1631600 | 000e2a70 | 0002438a | 000e48d4 | 0015206e | 6f742064 | 65636c61 | 72656420 | 6561726c | 69657200 | 000d7470 | 01004697 | 00002c07 |
| 1631660 | 0000000c | 000e69a0 | 000e69a0 | 00010059 | 00000000 | 2cac5264 | 0002438a | 2ca06935 | 00000000 | 00000001 | 000e2d79 | 000e2d78 |
| 1631740 | 0002438a | 000e48d0 | ffffffff | 030046af | 00002c07 | 0000000c | 000e69c8 | 000e69c8 | 00010059 | 00000000 | 000dfe30 | 030046b7 |
| 1632020 | 00002c07 | 0000000c | 000e6af8 | 000e6af8 | 00010059 | 00000000 | 2cac69b2 | 0002438a | 2ca00fd3 | 00000000 | 00000001 | 000e3150 |
| 1632100 | 000e3150 | 0002438a | 000e69c4 | 000e315c | 2cac088f | 0002438a | 2ca069c9 | 00000000 | 00000001 | 000e3278 | 000e33d0 | 0002438a |
| 1632160 | 000e69ec | 000da784 | 00176d6f | 72655f65 | 6e746974 | 795f6465 | 7369676e | 61746f72 | 73006a16 | 000d77e0 | 010046bf | 00002c07 |
| 1632240 | 0000000c | 000e6a6c | 000e6a6c | 00010059 | 00000000 | 0007fffc | 010046c7 | 00002c07 | 0000000c | 000e6aac | 000e6aac | 00010059 |
| 1632320 | 00000000 | ffffffff | 020046ef | 00002c07 | 00000008 | 000939e0 | 0002438a | 0003005a | 00000000 | 2cac0ed3 | 0002438a | 2ca06a69 |
| 1632400 | 00000000 | 00000001 | 000e34d8 | 000e3560 | 0002438a | 000e6a90 | 000c920c | 2b240ee3 | 0002438a | 000e3570 | b4646a91 | 000e35b8 |
| 1632460 | 000e6ad4 | 2cac1b73 | 0002438a | 2ca05515 | 00000000 | 00000001 | 000e3670 | 000e3754 | 0002438a | 000e6ad0 | 000daa8c | b4646ae6 |
| 1632540 | 000e3728 | 000e6aec | 2b245569 | 0002438a | 000e3764 | b464088f | 000e3790 | 000e6b20 | 2cac6aed | 0002438a | 2ca0088f | 00000000 |
| 1632620 | 00000001 | 000e37fc | 000e3e8c | 0002438a | 000e6b1c | 000dac24 | b46455d1 | 000e3854 | 000e6b38 | 2aa8088f | 000e6b44 | 000e3898 |
| 1632700 | b4646b2d | 000e38e0 | 000e6b50 | 2aa81173 | 000e6b5c | 000e3924 | b4646b62 | 000e396c | 000e6b68 | 2aa8564d | 000e6b74 | 000e39b0 |
| 1632760 | b464088f | 000e39f8 | 000e6b80 | 2aa86b69 | 000e6b8c | 000e3a3c | b4641073 | 000e3a84 | 000e6b98 | 2aa86b9e | 000e6ba4 | 000e3ac8 |
| 1633040 | b46456b5 | 000e3b10 | 000e6bb0 | 2aa8088f | 000e6bbc | 000e3b54 | b4646ba5 | 000e3b9c | 000e6bc8 | 2aa81ae3 | 000e6bd4 | 000e3be0 |
| 1633120 | b464088f | 000e3c28 | 000e6be0 | 2aa86bc9 | 000e6bec | 000e3c6c | b4640fc3 | 000e3cb4 | 000e6bf8 | 2aa8088f | 000e6c04 | 000e3cf8 |
| 1633200 | b4646bed | 000e3d40 | 000e6c10 | 2aa80ed3 | 000e6c1c | 000e3d84 | b4646c22 | 000e3dcc | 000e6c28 | 2aa857d9 | 000e6c34 | 000e3e10 |
| 1633260 | b464088f | 000e3e58 | 00000000 | 2b246c29 | 0002438a | 000e3e9c | 2aa89038 | 000e9034 | 000ee510 | 2b246c44 | 0002438a | 000ee450 |
| 1633340 | 000f6465 | 63696d61 | 6c20696e | 74656765 | 720048bc | 000e4aa8 | 000eb230 | 2aa86c50 | 000e6c4c | 000ee3f0 | 2b246c78 | 0002438a |
| 1633420 | 000ee28c | 00067061 | 72736564 | 000e6c98 | 00097465 | 726d696e | 616c7300 | 000e6e6c | 0000002c | b288b66c | 00000612 | 7fffffff |
| 1633500 | 000da100 | 02000ce5 | 0100147d | 01002d65 | 0000000b | 00002aff | 00312f68 | 6f6d652f | 6f736173 | 312f612f | 73726565 | 2f73656d |
| 1633560 | 616e7469 | 635f6368 | 65636b31 | 2f747970 | 655f7365 | 6d616e74 | 69637300 | 00342f68 | 6f6d652f | 6f736173 | 312f612f | 73726565 |
| 1633640 | 2f73656d | 616e7469 | 635f6368 | 65636b31 | 2f747970 | 655f7365 | 6d616e74 | 6963732e | 706c0070 | 0000002c | 000e91b8 | b27cb66c |
| 1633720 | 00000614 | 7fffffff | 000e4970 | 02000ce5 | 0200293d | 0000474f | 000002db | 00002aff | 00000000 | 000cf774 | 000e03e8 | 00000000 |
| 1634000 | 00000000 | 000aaa00 | 00000000 | 00000000 | 00000000 | 000a4690 | 00000000 | 000db24d | 00000000 | 00000000 | 00000000 | 000ed9a1 |
| 1634060 | 00000000 | 000da54d | 000bdd08 | 00000000 | 000a6844 | 000ed7fc | 00000000 | 000aa96c | 00000000 | 000dae5c | 000cf971 | 00000000 |
| 1634140 | 000da970 | 00000000 | 000aeb24 | 00000000 | 00000000 | 00000000 | 00000000 | 0009ed64 | 00000000 | 0009cab0 | 00000000 | 00000000 |
| 1634220 | 00000000 | 000e8fcc | 000b4c95 | 000c9175 | 00000000 | 000c97c9 | 00000000 | 00000000 | 000b4cbc | 00000000 | 00000000 | 000d050c |
| 1634300 | 00000000 | 00000000 | 000e8e00 | 00000000 | 000b4d78 | 00000000 | 00000000 | 000a1ce8 | 00000000 | 00000000 | 00000000 | 00000000 |
| 1634360 | 000e6f60 | 0000009c | b27cb66c | 00000617 | 00000620 | 000e6e44 | 02000ce5 | 05001b0d | 00004537 | 0000001b | 00002c07 | 00746a83 |
| 1634440 | 000002db | 00002aff | 000e6ed0 | 0000002c | b4f0b4e4 | 00000616 | 7fffffff | 0007eaad | 00000000 | 00000000 | 000e703c | 0002438a |
| 1634520 | 000eb3ac | 000e6f60 | 00000038 | b27cb66c | 00000618 | 00000621 | 000e6f64 | 02000ce5 | 05001b0d | 00004537 | 0000002b | 00002c07 |
| 1634600 | 00746983 | 000002db | 00002aff | 28c40058 | 000e901c | 45c446d8 | 47685818 | 6d945fa0 | 305042ac | 00004757 | 00080d0c | 00183a4c |
| 1634660 | 00080d0c | 001442ac | 0000475f | 00080d0c | 001439f8 | 00080d0c | 001042ac | 00003ad7 | 00080d0c | 001039a4 | 00080d0c | 000c234c |
| 1634740 | 0007fd0c | 000e7038 | 000000ad | b27cb66c | 00000619 | 00000622 | 000e6f9c | 02000ce5 | 05001b0d | 00004767 | 0000000b | 00002c07 |
| 1635020 | 00758c03 | 000002db | 00002aff | 000e6fd0 | 00000038 | b27cb66c | 0000061a | 00000623 | 000e6fd4 | 02000ce5 | 05001b0d | 0000476f |
| 1635100 | 0000000b | 00002c07 | 00758f03 | 000002db | 00002aff | 000e7038 | 00000038 | b27cb66c | 0000061b | 00000624 | 000e703c | 02000ce5 |
| 1635160 | 05001b0d | 00004787 | 0000001b | 00002c07 | 00759563 | 000002db | 00002aff | 27f00030 | 000eb2dc | 252046ec | 47683310 | 24d00000 |
| 1635240 | 000eb1c0 | 001838d4 | 42680000 | 00000003 | 37f03cf4 | 242c0000 | 000eb2cc | 000e70a0 | 00000038 | b130b66c | 0000061c | 00000625 |
| 1635320 | 000e6ea9 | 02000ce5 | 05001b0d | 0000478f | 00000023 | 00002c07 | 00759663 | 000002db | 00002aff | 27f00030 | 000eb348 | 4e1c0000 |
| 1635400 | 00000007 | 35743050 | 2520247c | 00080d0c | 000c42ac | 00004797 | 00080d0c | 000c234c | 0007fd0c | 000e911c | 00001c10 | 6c697428 |
| 1635460 | 552c562c | 572c582c | 592c4c29 | 203c2d2d | 205b6465 | 63696d61 | 6c5f6c69 | 7428552c | 562c572c | 582c592c | 4c295d2c | 207b6173 |
| 1635540 | 73657274 | 6f6e6365 | 28706172 | 73656428 | 27646563 | 696d616c | 20696e74 | 65676572 | 272c4c29 | 297d2e0a | 62617365 | 645f6c69 |
| 1635620 | 7428552c | 562c572c | 582c592c | 542c4c29 | 203c2d2d | 205b6261 | 7365645f | 6c697428 | 552c562c | 572c582c | 592c542c | 4c295d2c |
| 1635700 | 207b6173 | 73657274 | 6f6e6365 | 28706172 | 73656428 | 27626173 | 65642069 | 6e746567 | 6572272c | 4c29297d | 2e0a6269 | 745f7374 |
| 1635760 | 725f6c69 | 7428582c | 592c4c29 | 203c2d2d | 205b6269 | 745f7374 | 725f6c69 | 7428582c | 592c4c29 | 5d2c207b | 61737365 | 72746f6e |
| 1636040 | 63652870 | 61727365 | 64282762 | 69742073 | 7472696e | 67272c4c | 29297d2e | 0a636861 | 725f6c69 | 7428432c | 4c29203c | 2d2d205b |
| 1636120 | 63686172 | 5f6c6974 | 28432c4c | 295d2c20 | 7b617373 | 6572746f | 6e636528 | 70617273 | 65642827 | 63686172 | 61637465 | 72206c69 |
| 1636200 | 74657261 | 6c272c4c | 29297d2e | 0a766172 | 5f617373 | 69676e28 | 4c29203c | 2d2d205b | 7661725f | 61737369 | 676e284c | 295d2c20 |
| 1636260 | 7b617373 | 6572746f | 6e636528 | 70617273 | 65642827 | 3a3d272c | 4c29297d | 2e0a706f | 696e7428 | 4c29203c | 2d2d205b | 706f696e |
| 1636340 | 74284c29 | 5d2c207b | 61737365 | 72746f6e | 63652870 | 61727365 | 6428272e | 272c4c29 | 297d2e0a | 76626172 | 284c2920 | 3c2d2d20 |
| 1636420 | 5b766261 | 72284c29 | 5d2c207b | 61737365 | 72746f6e | 63652870 | 61727365 | 6428277c | 272c4c29 | 297d2e0a | 626f7828 | 4c29203c |
| 1636500 | 2d2d205b | 626f7828 | 4c295d2c | 207b6173 | 73657274 | 6f6e6365 | 28706172 | 73656428 | 273c3e27 | 2c4c2929 | 7d2e0a0a | 000e72da |
| 1636560 | 000dee29 | 000e72e2 | 000dee29 | 000e72e2 | 000dee29 | 000e72e2 | 000e71b5 | 000e72fa | 000e7195 | 000e7302 | 000e7195 | 000e7302 |
| 1636640 | 000e7195 | 000e7302 | 000e7195 | 000e7302 | 000e7195 | 000e7302 | 000e7195 | 000e7302 | 000e7195 | 000e7302 | 000e7121 | 000e733a |

| | | | | | | | | | | | | |
|---|---|---|---|---|---|---|---|---|---|---|---|---|
| 1636720 | 000e7121 | 000e733a | 000e7121 | 000e733a | 000e7121 | 000e733a | 000e7121 | 000e733a | 000e70c1 | 000e7362 | 000e70c1 | 000e7362 |
| 1637000 | 000e70c1 | 000e7362 | 000e70a1 | 000e737a | 000e7081 | 000e7382 | 000e7081 | 000e7382 | 000e7081 | 000e7382 | 000e706d | 000e739a |
| 1637060 | 000e7059 | 000e73a2 | 000e7041 | 000e73aa | 000e7041 | 000e73aa | 000e7041 | 000e73aa | 000e73d1 | 000e73aa | 0200088f | 000000a7 |
| 1637140 | 000e7039 | 000e73d1 | 000e73aa | 000e6ff1 | 000e73de | 000e6fd9 | 000e73e6 | 000e6fd9 | 000e73e6 | 000e6fd9 | 000e73e6 | 000e6f9d |
| 1637220 | 000e73fe | 000e6f89 | 000e7406 | 000e6f71 | 000e740e | 000e6f71 | 000e740e | 000e6f71 | 000e740e | 000e7435 | 000e740e | 0200088f |
| 1637300 | 000000a7 | 000e6f69 | 000e7435 | 000e740e | 000e6f21 | 000e7442 | 000e6f09 | 000e744a | 000e6f09 | 000e744a | 000e6f09 | 000e744a |
| 1637360 | 000e6ecd | 000e7462 | 000e7479 | 000e7462 | 0300088f | 0000007f | 000e6ec5 | 000e6ed9 | 000e7479 | 000e7462 | 000e6ea1 | 000e748a |
| 1637440 | 000e6ea1 | 000e748a | 000e6ea1 | 000e748a | 000e6e65 | 000e74a2 | 000e6e51 | 000e74aa | 000e6e39 | 000e74b2 | 000e6e39 | 000e74b2 |
| 1637520 | 000e6e39 | 000e74b2 | 000e74d9 | 000e74b2 | 0200088f | 000000a7 | 000e6e31 | 000e74d9 | 000e74b2 | 000e6de9 | 000e74e6 | 000e6dd1 |
| 1637600 | 000e74ee | 000e6dd1 | 000e74ee | 000e6d41 | 000e74ee | 000e6d95 | 000e7506 | 000e6d81 | 000e750e | 000e6d69 | 000e7516 | 000e6d69 |
| 1637660 | 000e7516 | 000e6d69 | 000e7516 | 000e6d2d | 000e752e | 000e6d19 | 000e7536 | 000e6d01 | 000e753e | 000e6d01 | 000e753e | 000e6d01 |
| 1637740 | 000e753e | 000e6cc5 | 000e7555 | 000e756d | 000e7556 | 0300088f | 0000007f | 000e6cbd | 000e6cd1 | 000e756d | 000e7556 | 000e6c99 |
| 1640020 | 000e757e | 000e6c99 | 000e757e | 000e6c99 | 000e757e | 000e6c5d | 000e7596 | 000e75ad | 000e7596 | 0300088f | 0000007f | 000e6c55 |
| 1640100 | 000e6c69 | 000e75ad | 000e7596 | 000e6c31 | 000e75be | 000e6c31 | 000e75be | 000e6c31 | 000e75be | 000e6bf5 | 000e75d6 | 000e75ed |
| 1640160 | 000e75d6 | 0300088f | 0000007f | 000e6bed | 000e6c01 | 000e75ed | 000e75d6 | 000e6bc9 | 000e75fe | 000e6bc9 | 000e75fe | 000e6bc9 |
| 1640240 | 000e75fe | 000e6b8d | 000e7616 | 000e762d | 000e7616 | 0300088f | 0000007f | 000e6b85 | 000e6b99 | 000e762d | 000e7616 | 000e6b65 |
| 1640320 | 000e763e | 000e6b4d | 000e7646 | 000e6b4d | 000e7646 | 000e6b4d | 000e7646 | 000e6b11 | 000e765e | 000e7675 | 000e765e | 0300088f |
| 1640400 | 0000007f | 000e6b09 | 000e6b1d | 000e7675 | 000e765e | 000e6ae5 | 000e7686 | 000e6ae5 | 000e7686 | 000e6ae5 | 000e7686 | 000e6aa9 |
| 1640460 | 000e769e | 000e76b5 | 000e769e | 0300088f | 0000007f | 000e6aa1 | 000e6ab5 | 000e76b5 | 000e769e | 000e6a81 | 000e76c6 | 000e6a69 |
| 1640540 | 000e76ce | 000e6a69 | 000e76ce | 000e6a69 | 000e76ce | 000e6a2d | 000e76e5 | 000e76fd | 000e76e6 | 0300088f | 0000007f | 000e6a25 |
| 1640620 | 000e6a39 | 000e76fd | 000e76e6 | 000e6a01 | 000e770e | 000e6a01 | 000e770e | 000e6a01 | 000e770e | 000e69c5 | 000e7726 | 000e773d |
| 1640700 | 000e7726 | 0300088f | 0000007f | 000e69bd | 000e69d1 | 000e773d | 000e7726 | 000e6999 | 000e774e | 000e6999 | 000e774e | 000e6999 |
| 1640760 | 000e774e | 000e6951 | 000e7766 | 000e777d | 000e7766 | 0300088f | 0000007f | 000e6955 | 000e6969 | 000e777d | 000e7766 | 000e6931 |
| 1641040 | 000e778e | 000e6931 | 000e778e | 000e6931 | 000e778e | 000e68f5 | 000e77a6 | 000e77bd | 000e77a6 | 0300088f | 0000007f | 000e68ed |
| 1641120 | 000e6901 | 000e77bd | 000e77a6 | 000e68c9 | 000e77ce | 000e68c9 | 000e77ce | 000e68c9 | 000e77ce | 000e688d | 000e77e6 | 000e6879 |
| 1641200 | 000e77ee | 000e6861 | 000e77f6 | 000e6861 | 000e77f6 | 000e6861 | 000e77f6 | 000e6825 | 000e780e | 000e6811 | 000e7816 | 000e67f9 |
| 1641260 | 000e781e | 000e67f9 | 000e781e | 000e67f9 | 000e781e | 000e67bd | 000e7836 | 000e784d | 000e7836 | 0300088f | 0000007f | 000e67b5 |
| 1641340 | 000e67c9 | 000e784d | 000e7836 | 000e6791 | 000e785e | 000e6791 | 000e785e | 000e6791 | 000e785e | 000e6755 | 000e7876 | 000e6741 |
| 1641420 | 000e787e | 000e6729 | 000e7886 | 000e6729 | 000e7886 | 000e6729 | 000e7886 | 000e66ed | 000e789e | 000e66d9 | 000e78a6 | 000e66c1 |
| 1641500 | 000e78ae | 000e66c1 | 000e78ae | 000e66c1 | 000e78ae | 000e78d5 | 000e78ae | 0200088f | 000000a7 | 000e66b9 | 000e78d5 | 000e78ae |
| 1641560 | 000e6671 | 000e78e2 | 000e6659 | 000e78ea | 000e6659 | 000e78ea | 000e6659 | 000e78ea | 000e661d | 000e7902 | 000e6609 | 000e790a |
| 1641640 | 000e65f1 | 000e7912 | 000e65f1 | 000e7912 | 000e65f1 | 000e7912 | 000e65b5 | 000e792a | 000e7941 | 000e792a | 0300088f | 0000007f |
| 1641720 | 000e65ad | 000e65c1 | 000e7941 | 000e792a | 000e6589 | 000e7952 | 000e6589 | 000e7952 | 000e6589 | 000e7952 | 000e654d | 000e796a |
| 1642000 | 000e7981 | 000e796a | 0300088f | 0000007f | 000e6545 | 000e6559 | 000e7981 | 000e796a | 000e6521 | 000e7992 | 000e6521 | 000e7992 |
| 1642060 | 000e6521 | 000e7992 | 000e64e5 | 000e79aa | 000e79c1 | 000e79aa | 0300088f | 0000007f | 000e64dd | 000e64f1 | 000e79c1 | 000e79aa |
| 1642140 | 000e64b9 | 000e79d2 | 000e64b9 | 000e79d2 | 000e64b9 | 000e79d2 | 000e647d | 000e79ea | 000e6469 | 000e79f2 | 000e6451 | 000e79fa |
| 1642220 | 000e6451 | 000e79fa | 000e6451 | 000e79fa | 000e7a21 | 000e79fa | 0200088f | 000000a7 | 000e6449 | 000e7a21 | 000e79fa | 000e63fd |
| 1642300 | 000e7a2e | 000e63fd | 000e7a2e | 000e63fd | 000e7a2e | 000e63c1 | 000e7a46 | 000e7a5d | 000e7a46 | 0300088f | 0000007f | 000e63b9 |
| 1642360 | 000e63cd | 000e7a51 | 000e7a46 | 000e6395 | 000e7a6e | 000e6395 | 000e7a6e | 000e6395 | 000e7a6e | 000e6365 | 000e7a86 | 000e6351 |
| 1642440 | 000e7a8e | 000e633d | 000e7a96 | 000e633d | 000e7a96 | 000e633d | 000e7a96 | 000e6315 | 000e7aae | 000e6301 | 000e7ab6 | 000e62ed |
| 1642520 | 000e7abe | 000e62ed | 000e7abe | 000e62ed | 000e7abe | 000e7ae5 | 000e7abe | 0100088f | 000000c7 | 000e7ae5 | 000e7abe | 000e62a5 |
| 1642600 | 000e7aee | 000e6291 | 000e7af6 | 000e6291 | 000e7af6 | 000e6291 | 000e7af6 | 000e625d | 000e7b0e | 000e7b25 | 000e7b0e | 0300088f |
| 1642660 | 0000007f | 000e6255 | 000e6269 | 000e7b25 | 000e7b0e | 000e6215 | 000e7b36 | 000e621d | 000e7b3e | 000e621d | 000e7b56 | 000e6235 |
| 1642740 | 000e7b5e | 000e7b25 | 000e7b66 | 000e6291 | 000e7b6e | 000e62a5 | 000e7b76 | 000e7ae5 | 000e7b7e | 000e7b85 | 000e7ab6 | 0200088f |
| 1643020 | 000006af | 000e630d | 0200088f | 00000ea3 | 000e6215 | 000e7b91 | 000e7bb2 | 0200088f | 00001173 | 000e6241 | 000e7ba5 | 000e7bc2 |
| 1643100 | 0100088f | 00001ae3 | 000e7bb9 | 000e7bd2 | 0100088f | 00000f23 | 000e7bc9 | 000e7be6 | 0200088f | 00000fd3 | 000e62b1 | 000e7bd9 |
| 1643160 | 000e7bf6 | 0100088f | 00001c03 | 000e7bed | 000e7c06 | 0100088f | 00001653 | 000e7bfd | 000e7c16 | 0100088f | 00001183 | 000e7c0d |
| 1643240 | 000e7c26 | 0100088f | 00000ef3 | 000e7c1d | 000e7c36 | 0100088f | 00000f93 | 000e7c2d | 000e7c46 | 0100088f | 00001183 | 000e7c3d |
| 1643320 | 000e7c5a | 0200088f | 00000ea3 | 000e638d | 000e7c4d | 000e7c6a | 0100088f | 00001ae3 | 000e7c61 | 000e7c7e | 0200088f | 00000ed3 |
| 1643400 | 000e63f5 | 000e7c71 | 000e7c92 | 0200088f | 00001bf3 | 000e6449 | 000e7c85 | 000e7ca6 | 0200088f | 00000fd3 | 000e6475 | 000e7c99 |
| 1643460 | 000e7cb6 | 0100088f | 00000fe3 | 000e7cad | 000e7cca | 0200088f | 00000ea3 | 000e64b1 | 000e7cbd | 000e7cda | 0100088f | 00001ae3 |
| 1643540 | 000e7cd1 | 000e7cee | 0200088f | 00000ed3 | 000e6519 | 000e7ce1 | 000e7d02 | 0200088f | 00001b63 | 000e6545 | 000e7cf5 | 000e7d1a |
| 1643620 | 0300088f | 00000ee3 | 000e6599 | 000e6581 | 000e7d09 | 000e7d32 | 0300088f | 00001b73 | 000e65ad | 000e65c1 | 000e7d21 | 000e7d4a |
| 1643700 | 0300088f | 00000ee3 | 000e6601 | 000e65e9 | 000e7d39 | 000e7d5e | 0200088f | 00000fd3 | 000e6615 | 000e7d51 | 000e7d72 | 0200088f |
| 1643760 | 00001173 | 000e6629 | 000e7d65 | 000e7d8a | 0300088f | 00000ee3 | 000e6669 | 000e6651 | 000e7d79 | 000e7d9e | 0200088f | 00000fd3 |

| | | | | | | | | | | | | |
|---|---|---|---|---|---|---|---|---|---|---|---|---|
| 1644040 | 000e667d | 000e7d91 | 000e7db2 | 0200088f | 00001bf3 | 000e66b9 | 000e7da5 | 000e7dc6 | 0200088f | 00001173 | 000e66e5 | 000e7db9 |
| 1644120 | 000e7dda | 0200088f | 00000fd3 | 000e66f9 | 000e7dcd | 000e7dee | 0200088f | 00000ed3 | 000e6721 | 000e7de1 | 000e7e02 | 0200088f |
| 1644200 | 00001073 | 000e674d | 000e7df5 | 000e7e16 | 0200088f | 00001073 | 000e6761 | 000e7e09 | 000e7e2a | 0200088f | 00000ea3 | 000e6789 |
| 1644260 | 000e7e1d | 000e7e3a | 0100088f | 00001ae3 | 000e7e31 | 000e7e4e | 0200088f | 00000ed3 | 000e67f1 | 000e7e41 | 000e7e5e | 0100088f |
| 1644340 | 00000fc3 | 000e7e55 | 000e7e72 | 0200088f | 00001073 | 000e6831 | 000e7e65 | 000e7e86 | 0200088f | 00000ed3 | 000e6859 | 000e7e79 |
| 1644420 | 000e7e9a | 0200088f | 00000fd3 | 000e6885 | 000e7e8d | 000e7eae | 0200088f | 00001173 | 000e6899 | 000e7ea1 | 000e7ec2 | 0200088f |
| 1644500 | 00000ea3 | 000e68c1 | 000e7eb5 | 000e7ed6 | 0200088f | 00001a33 | 000e6901 | 000e7ec9 | 000e7eea | 0200088f | 00000ea3 | 000e6929 |
| 1644560 | 000e7edd | 000e7efa | 0100088f | 00001a23 | 000e7ef1 | 000e7f0e | 0200088f | 00000ea3 | 000e6991 | 000e7f01 | 000e7f22 | 0200088f |
| 1644640 | 00001b33 | 000e69bd | 000e7f15 | 000e7f3a | 0300088f | 00000ee3 | 000e6a11 | 000e69f9 | 000e7f29 | 000e7f52 | 0300088f | 00001b73 |
| 1644720 | 000e6a25 | 000e6a39 | 000e7f41 | 000e7f6a | 0300088f | 00000ee3 | 000e6a79 | 000e6a61 | 000e7f59 | 000e7f7a | 0100088f | 00001033 |
| 1645000 | 000e7f71 | 000e7f92 | 0300088f | 00001b73 | 000e6aa1 | 000e6ab5 | 000e7f81 | 000e7faa | 0300088f | 00000ee3 | 000e6af5 | 000e6add |
| 1645060 | 000e7f99 | 000e7fc2 | 0300088f | 00001b73 | 000e6b09 | 000e6b1d | 000e7fb1 | 000e7fda | 0300088f | 00000ee3 | 000e6b5d | 000e6b45 |
| 1645140 | 000e7fc9 | 000e7fea | 0100088f | 00001033 | 000e7fe1 | 000e8002 | 0300088f | 00001b73 | 000e6b85 | 000e6b99 | 000e7ff1 | 000e801a |
| 1645220 | 0300088f | 00000ee3 | 000e6bd9 | 000e6bc1 | 000e8009 | 000e8032 | 0300088f | 00001b73 | 000e6bed | 000e6c01 | 000e8021 | 000e804a |
| 1645300 | 0300088f | 00000ee3 | 000e6c41 | 000e6c29 | 000e8039 | 000e8062 | 0300088f | 00001b73 | 000e6c55 | 000e6c69 | 000e8051 | 000e807a |
| 1645360 | 0300088f | 00000ee3 | 000e6ca9 | 000e6c91 | 000e8069 | 000e8092 | 0300088f | 00001b73 | 000e6cbd | 000e6cd1 | 000e8081 | 000e80aa |
| 1645440 | 0300088f | 00000ee3 | 000e6d11 | 000e6cf9 | 000e8099 | 000e80be | 0200088f | 00001073 | 000e6d25 | 000e80b1 | 000e80d2 | 0200088f |
| 1645520 | 00001173 | 000e6d39 | 000e80c5 | 000e80ea | 0300088f | 00000ee3 | 000e6d79 | 000e6d61 | 000e80d9 | 000e80fe | 0200088f | 00000fd3 |
| 1645600 | 000e6d8d | 000e80f1 | 000e8112 | 0200088f | 00001073 | 000e6da1 | 000e8105 | 000e812a | 0300088f | 00000ee3 | 000e6de1 | 000e6dc9 |
| 1645660 | 000e8119 | 000e813e | 0200088f | 00001073 | 000e6df5 | 000e8131 | 000e8152 | 0200088f | 00001bf3 | 000e6e31 | 000e8145 | 000e8166 |
| 1645740 | 0200088f | 00001073 | 000e6e54 | 000e8159 | 000e817a | 0200088f | 00001073 | 000e6e71 | 000e816d | 000e8192 | 0300088f | 00000ee3 |
| 1646020 | 000e6eb1 | 000e6e99 | 000e8181 | 000e81aa | 0300088f | 00001b73 | 000e6ec5 | 000e6ed9 | 000e8199 | 000e81c2 | 0300088f | 00000ee3 |
| 1646100 | 000e6f19 | 000e6f01 | 000e81b1 | 000e81d6 | 0200088f | 00000fd3 | 000e6f2d | 000e81c9 | 000e81ea | 0200088f | 00001bf3 | 000e6f69 |
| 1646160 | 000e81dd | 000e81fe | 0200088f | 00001073 | 000e6f95 | 000e81f1 | 000e8212 | 0200088f | 00001073 | 000e6fa9 | 000e8205 | 000e822a |
| 1646240 | 0300088f | 00000ee3 | 000e6fe9 | 000e6fd1 | 000e8219 | 000e823e | 0200088f | 00001073 | 000e6ffd | 000e8231 | 000e8252 | 0200088f |
| 1646320 | 00001bf3 | 000e7039 | 000e8245 | 000e8266 | 0200088f | 00001073 | 000e7065 | 000e8259 | 000e827a | 0200088f | 00001073 | 000e7079 |
| 1646400 | 000e826d | 000e828e | 0200088f | 00000573 | 000e7099 | 000e8281 | 000e829e | 0100088f | 00000b33 | 000e8295 | 000e82b2 | 0200088f |
| 1646460 | 000003f3 | 000e70d1 | 000e82a5 | 000e82c6 | 0200088f | 00000283 | 000e712d | 000e82b9 | 000e82da | 0200088f | 00000503 | 000e71ad |
| 1646540 | 000e82cd | 000e82ee | 0200088f | 000004b3 | 000e71cd | 000e82e1 | 000e8306 | 0300088f | 00000093 | 000dee39 | 000e4e81 | 000e82f5 |
| 1646620 | 000e831a | 0200088f | 00000723 | 000e7205 | 000e830d | 000e832a | 0100088f | 000008a3 | 000e8321 | 000e833a | 0100088f | 00000663 |
| 1646700 | 000e8331 | 000e834a | 0100088f | 00000253 | 000e8341 | 000e835e | 0200088f | 00000053 | 000df0c1 | 000e8351 | 00000007 | 01001eaf |
| 1646760 | 006bf923 | 000020bf | 0000002b | 02000abf | 0000000f | 00000013 | 01002037 | 000e8375 | 0200088f | 00000567 | 000e8395 | 01002a47 |
| 1647040 | 0000002b | 0200088f | 00000087 | 000e83a9 | 010026af | 00000083 | 0200088f | 0000008f | 000e83bd | 01002a47 | 0000002b | 02000abf |
| 1647120 | 000020bf | 0000002b | 02000abf | 0000000f | 00000013 | 01002037 | 000e83d1 | 0200088f | 00000567 | 000e83f1 | 01002a47 | 0000002b |
| 1647200 | 0200088f | 00000087 | 000e8405 | 010026af | 0000006b | 0200088f | 0000008f | 000e8419 | 01002a47 | 0000002b | 02000abf | 000020bf |
| 1647260 | 0000002b | 02000abf | 0000000f | 00000013 | 01002037 | 000e842d | 0200088f | 00000567 | 000e844d | 01002a47 | 0000002b | 0200088f |
| 1647340 | 00000087 | 000e8461 | 010026af | 0000005b | 0200088f | 0000008f | 000e8475 | 01002a47 | 0000002b | 02000abf | 000020bf | 0000002b |
| 1647420 | 02000abf | 0000000f | 00000013 | 01002037 | 000e8489 | 0200088f | 00000567 | 000e84a9 | 01002a47 | 0000002b | 0200088f | 00000087 |
| 1647500 | 000e84bd | 010026af | 0000004b | 0200088f | 0000008f | 000e84d1 | 01002a47 | 0000002b | 02000abf | 000020bf | 0000002b | 02000abf |
| 1647560 | 0000000f | 00000013 | 01002037 | 000e84e5 | 0200088f | 00000567 | 000e8505 | 01002a47 | 0000002b | 0200088f | 00000087 | 000e8519 |
| 1647640 | 010026af | 0000003b | 0200088f | 0000008f | 000e852d | 01002a47 | 0000002b | 02000abf | 000020bf | 0000002b | 02000abf | 0000000f |
| 1647720 | 00000013 | 01002037 | 000e8541 | 0200088f | 00000567 | 000e8561 | 01002a47 | 0000002b | 0200088f | 00000087 | 000e8575 | 010026af |
| 1650000 | 0000002b | 0200088f | 0000008f | 000e8589 | 01002a47 | 0000002b | 02000abf | 000020bf | 0000002b | 02000abf | 0000000f | 00000013 |
| 1650060 | 01002037 | 000e859d | 0200088f | 00000567 | 000e85bd | 01002a47 | 0000002b | 0200088f | 00000087 | 000e85d1 | 010026af | 00000013 |
| 1650140 | 0100088f | 000000af | 02000abf | 000020bf | 00000023 | 02000abf | 0000000f | 00000013 | 01002037 | 000e85ed | 0200088f | 00000567 |
| 1650220 | 000e860d | 01002a47 | 00000023 | 0200088f | 0000008f | 000e8621 | 01002a47 | 00000023 | 0100088f | 000000af | 02000abf | 000020bf |
| 1650300 | 00000023 | 02000abf | 000031f7 | 00000013 | 01002037 | 000e863d | 01002037 | 000e863d | 0300088f | 00000557 | 000e8669 | 000e8651 |
| 1650360 | 01002a47 | 00000023 | 0200088f | 000000cf | 000e867d | 01001d77 | 00003ebf | 0200088f | 0000008f | 000e8691 | 01002a47 | 00000023 |
| 1650440 | 02000abf | 000020bf | 00000023 | 02000abf | 00000a3f | 00000013 | 01002037 | 000e86a5 | 01002037 | 000e86a5 | 0300088f | 00000557 |
| 1650520 | 000e86d1 | 000e86b9 | 01002a47 | 00000023 | 0200088f | 0000008f | 000e86e5 | 01002a47 | 0000002b | 0200088f | 0000008f | 000e86f9 |
| 1650600 | 01002a47 | 00000023 | 02000abf | 000020bf | 0000002b | 02000abf | 00000cdf | 00000013 | 01002037 | 000e870d | 01002037 | 000e870d |
| 1650660 | 0300088f | 00000557 | 000e8739 | 000e8721 | 01002a47 | 0000002b | 0200088f | 00000087 | 000e874d | 010026af | 0000000b | 0200088f |
| 1650740 | 0000008f | 000e8761 | 01002a47 | 0000002b | 02000abf | 000020bf | 0000002b | 02000abf | 00001b77 | 0000000b | 01002037 | 000e8775 |
| 1651020 | 01002037 | 000e8775 | 0300088f | 00000557 | 000e87a1 | 000e8789 | 01002a47 | 0000002b | 0200088f | 0000008f | 000e87b5 | 01002a47 |
| 1651100 | 0000002b | 02000abf | 000020bf | 0000002b | 02000abf | 00003d3f | 0000000b | 01002037 | 000e87c9 | 01002037 | 000e87c9 | 0300088f |

| | | | | | | | | | | | | |
|---|---|---|---|---|---|---|---|---|---|---|---|---|
| 1651160 | 00000557 | 000e87f5 | 000e87dd | 01002a47 | 0000002b | 0200088f | 00000087 | 000e8809 | 010026af | 00000093 | 02000abf | 000020bf |
| 1651240 | 00000023 | 02000abf | 00000a3f | 00000013 | 01002037 | 000e881d | 01002037 | 000e881d | 0300088f | 00000557 | 000e8849 | 000e8831 |
| 1651320 | 01002a47 | 00000023 | 0200088f | 0000008f | 000e885d | 01002a47 | 0000002b | 0200088f | 0000008f | 000e8871 | 01002a47 | 00000023 |
| 1651400 | 02000abf | 000020bf | 0000002b | 02000abf | 00000887 | 00000013 | 01002037 | 000e8885 | 01002037 | 000e8885 | 0300088f | 00000557 |
| 1651460 | 000e88b1 | 000e8899 | 01002a47 | 0000002b | 0200088f | 00000097 | 000e88c5 | 010026af | 0000006b | 0200088f | 0000008f | 000e88d9 |
| 1651540 | 01002a47 | 0000002b | 02000abf | 000020bf | 0000002b | 02000abf | 00003ebf | 0000001b | 01002037 | 000e88ed | 01002037 | 000e88ed |
| 1651620 | 0300088f | 00000557 | 000e8919 | 000e8901 | 01002a47 | 0000002b | 0200088f | 00000097 | 000e892d | 010026af | 0000000b | 0200088f |
| 1651700 | 00000087 | 000e8941 | 010026af | 0000007b | 0100088f | 00002bb7 | 02000abf | 000020bf | 00000023 | 02000abf | 00000a3f | 00000013 |
| 1651760 | 01002037 | 000e895d | 01002037 | 000e895d | 0300088f | 00000557 | 000e8989 | 000e8971 | 01002a47 | 00000023 | 0200088f | 0000008f |
| 1652040 | 000e899d | 01002a47 | 0000002b | 0200088f | 0000008f | 000e89b1 | 01002a47 | 00000023 | 02000abf | 000020bf | 0000002b | 02000abf |
| 1652120 | 00000887 | 00000013 | 01002037 | 000e89c5 | 01002037 | 000e89c5 | 0300088f | 00000557 | 000e89f1 | 000e89d9 | 01002a47 | 0000002b |
| 1652200 | 0200088f | 00000097 | 000e8a05 | 010026af | 0000004b | 0200088f | 0000008f | 000e8a19 | 01002a47 | 0000002b | 02000abf | 000020bf |
| 1652260 | 0000002b | 02000abf | 00003ebf | 0000000b | 01002037 | 000e8a2d | 01002037 | 000e8a2d | 0300088f | 00000557 | 000e8a59 | 000e8a41 |
| 1652340 | 01002a47 | 0000002b | 0200088f | 00000097 | 000e8a6d | 010026af | 0000000b | 02000abf | 000020bf | 00000023 | 02000abf | 00000a3f |
| 1652420 | 00000013 | 01002037 | 000e8a81 | 01002037 | 000e8a81 | 0300088f | 00000557 | 000e8aad | 000e8a95 | 01002a47 | 00000023 | 0200088f |
| 1652500 | 0000008f | 000e8ac1 | 01002a47 | 0000002b | 0200088f | 0000008f | 000e8ad5 | 01002a47 | 00000023 | 02000abf | 000020bf | 0000002b |
| 1652560 | 02000abf | 00000887 | 00000013 | 01002037 | 000e8ae9 | 01002037 | 000e8ae9 | 0300088f | 00000557 | 000e8b15 | 000e8afd | 01002a47 |
| 1652640 | 0000002b | 0200088f | 00000097 | 000e8b29 | 010026af | 0000002b | 0200088f | 0000008f | 000e8b3d | 01002a47 | 0000002b | 02000abf |
| 1652720 | 000020bf | 0000002b | 02000abf | 00003ebf | 0000000b | 01002037 | 000e8b51 | 01002037 | 000e8b51 | 0300088f | 00000557 | 000e8b7d |
| 1653000 | 000e8b65 | 01002a47 | 0000002b | 0200088f | 00000097 | 000e8b91 | 010026af | 0000000b | 02000abf | 000020bf | 00000023 | 02000abf |
| 1653060 | 00000a3f | 00000013 | 01002037 | 000e8ba5 | 01002037 | 000e8ba5 | 0300088f | 00000557 | 000e8bd1 | 000e8bb9 | 01002a47 | 00000023 |
| 1653140 | 0200088f | 000000cf | 000e8be5 | 01001d77 | 0000093f | 0200088f | 0000008f | 000e8bf9 | 01002a47 | 00000023 | 02000abf | 000020bf |
| 1653220 | 00000023 | 02000abf | 00000a3f | 00000013 | 01002037 | 000e8c0d | 01002037 | 000e8c0d | 0300088f | 00000557 | 000e8c39 | 000e8c21 |
| 1653300 | 01002a47 | 00000023 | 0200088f | 0000008f | 000e8c4d | 01002a47 | 00000023 | 0200088f | 0000008f | 000e8c61 | 01002a47 | 0000002b |
| 1653360 | 02000abf | 000020bf | 00000023 | 02000abf | 00000887 | 00000013 | 01002037 | 000e8c75 | 01002037 | 000e8c75 | 0300088f | 00000557 |
| 1653440 | 000e8ca1 | 000e8c89 | 01002a47 | 00000023 | 0200088f | 0008009c | 010046f7 | 00002c07 | 00000004 | 000e8ccc | 000e8ccc | 0001005a |
| 1653520 | 00000000 | 2cac0023 | 0002438a | 2ca020bf | 00000000 | 00000001 | 000e4a9c | 000e4a9c | 0002438a | 000e6c6c | 010036d7 | b3288cdd |
| 1653600 | 000e4bf8 | 00000000 | 000d6675 | 6e637072 | 6f636564 | 75726500 | 010036df | b328008f | 000e4cf0 | 00000000 | 000e8d40 | 05004537 |
| 1653660 | 00002c07 | 00000014 | 000b9704 | 000e901c | 0001005b | 00000000 | ffffffff | 03004537 | 00002c07 | 0000000c | 000e8f38 | 000eb120 |
| 1653740 | 0001005b | 00000000 | 03003697 | 29c80000 | 000edac0 | 000ee0ac | 010040b7 | b328002b | 000e4ee4 | 00000000 | 030036bf | 29c82a47 |
| 1654020 | 000e6c74 | 000ee390 | 010040df | b3288d99 | 000e4fdc | 00000000 | 03003387 | 29c820bf | 000e6c40 | 000ee4b0 | 0100413f | b3280013 |
| 1654100 | 000e50d4 | 00000000 | 03003367 | 29c88d1d | 000e9040 | 000ee5d0 | 03003697 | b3288dc1 | 000e524c | 00000000 | 27f0000e | 000ed4b0 |
| 1654160 | 54a84950 | 228c0000 | 03003377 | b328088f | 000e535c | 00000000 | 000047b7 | b328003b | 000e91bc | 00000000 | 030036bf | b3280abf |
| 1654240 | 000e546c | 00000000 | 000b3a20 | 6e6f7420 | 666f756e | 64000000 | 03003387 | b3280557 | 000e557c | 00000000 | 000047b7 | b328003b |
| 1654320 | 000e9214 | 00000000 | 03003367 | b3282a47 | 000e568c | 00000000 | 000e8e50 | 000da748 | 000c6765 | 745f706f | 73697469 | 6f6e0000 |
| 1654400 | 00036269 | 74000000 | 000ed633 | 00000000 | 010036cf | b3288e7d | 000e579c | 00000000 | 000d6465 | 7369676e | 5f656e74 | 69747900 |
| 1654460 | 0100367f | b328002b | 000e5894 | 00000000 | 0000000b | b32826af | 000c6548 | 00000000 | 0600374f | b3288ed1 | 000e598c | 00000000 |
| 1654540 | 000a7365 | 6d695f63 | 6865636b | 00000000 | 000d6261 | 73656420 | 696e7465 | 67657200 | 07003747 | b3288ee5 | 000e5bac | 00000000 |
| 1654620 | 000d6861 | 735f6368 | 61726163 | 74657200 | 000a6269 | 74207374 | 72696e67 | 00002a47 | 0300380f | b3280abf | 000e5d18 | 00000000 |
| 1654700 | 27f00010 | 000eb120 | 57b85fa0 | 5370228c | 00116368 | 61726163 | 74657220 | 6c697465 | 72616c00 | 02003757 | b3288f4d | 000e5e20 |
| 1654760 | 00000000 | 0000474f | b3280000 | 000b96a4 | 00000000 | 0100368f | b328088f | 000e5f1c | 00000000 | 000c7379 | 6e746178 | 5f636865 |
| 1655040 | 636b0000 | 01003707 | b328088f | 000e6014 | 00000000 | 000bdedc | 00000010 | 000efd8c | 00000000 | 0100373f | b328008f | 000e610c |
| 1655120 | 00000000 | 0000474f | b3282a47 | 000e6d48 | 00000000 | 010036b7 | b328088f | 000e6204 | 00000000 | 000e8d70 | 00000000 | 000e8fdc |
| 1655200 | 000e8fec | 000c7465 | 726d696e | 616c732e | 706c0000 | 000e8fb0 | 00000010 | 000e9068 | 00000008 | 29540014 | 0002438a | 58185fa0 |
| 1655260 | 67b822bc | 000e8d30 | 000e7078 | 2b249044 | 0002438a | 000ee570 | 2b249050 | 0002438a | 000ee630 | 0007626f | 6f6c6561 | 6e009058 |
| 1655340 | 00087374 | 616e6461 | 72640064 | 00000000 | 0000000c | 00000000 | 00087374 | 64706163 | 6b67007c | 00096572 | 726d7367 | 2e706c00 |
| 1655420 | 00077375 | 626c6973 | 7400907c | 00086469 | 66666c69 | 73740088 | 2b2490b0 | 0002438a | 000ed556 | 29c890bc | 000e90a0 | 000ed516 |
| 1655500 | 00067061 | 72656e74 | 000e90ac | 29c890bc | 000e90d0 | 000eb352 | 2b2490c8 | 0002438a | 000eb366 | 0008706f | 73697469 | 6f6e00e8 |
| 1655560 | 29c890e0 | 000e90f4 | 000eb27a | 2b2490ec | 0002438a | 000eb292 | 00095761 | 726e696e | 673a2000 | 00097061 | 72656e74 | 5f6f6600 |
| 1655640 | 000e9238 | 0000002c | b288b66c | 00000626 | 7fffffff | 000eb3b4 | 02000ce5 | 0100147d | 01002d65 | 0000000b | 00002aff | 00312f68 |
| 1655720 | 6f6d652f | 6f736173 | 312f612f | 73726565 | 2f73656d | 616e7469 | 635f6368 | 65636b31 | 2f686965 | 722f6869 | 65726675 | 6e637300 |
| 1656000 | 00342f68 | 6f6d652f | 6f736173 | 312f612f | 73726565 | 2f73656d | 616e7469 | 635f6368 | 65636b31 | 2f686965 | 722f6869 | 65726675 |
| 1656060 | 6e63732e | 706c0020 | 0000002c | 000eb410 | b27cb66c | 00000628 | 7fffffff | 000e6d44 | 02000ce5 | 0200293d | 000047b7 | 000002e3 |
| 1656140 | 00002aff | 00272f68 | 6f6d652f | 6f736173 | 312f612f | 73726565 | 2f73656d | 616e7469 | 635f6368 | 65636b31 | 2f686965 | 72006173 |
| 1656220 | 0000002c | 000eb43c | b27cb66c | 0000063f | 7fffffff | 000b96a0 | 02000ce5 | 02001f6d | 000047b7 | 00002c07 | 00002aff | 000e9314 |

| | | | | | | | | | | | | |
|---|---|---|---|---|---|---|---|---|---|---|---|---|
| 1656300 | 000000a4 | 000f411c | 7fffffff | 000eb460 | 000e9278 | 0000002c | b27cb66c | 0000062a | 0000063e | 0009cbc1 | 02000ce5 | 02002385 |
| 1656360 | 000047b7 | 00002c07 | 00002aff | 000e92b0 | 00000038 | b27cb65c | 0000062b | 00000640 | 000e9318 | 02000ce5 | 05001b0d | 00004067 |
| 1656440 | 0000001b | 00002c07 | 00679f03 | 000002e3 | 00002aff | 000e9314 | 0000002c | b4f0b4e4 | 0000062a | 7fffffff | 0007eaad | 00000000 |
| 1656520 | 00000000 | 000e9d3c | 0002438a | 000edafc | 2c780038 | 0002439a | 56f8671c | 682c4728 | 001c477c | 3348247c | 0007fccc | 0020332c |
| 1656600 | 3af4001c | 0007fccc | 001c38e9 | 3d6c1d30 | 24200000 | 000eb314 | 000e9398 | 00000038 | b27cb66c | 0000062c | 00000641 | 000e939c |
| 1656660 | 02000ce5 | 05001b0d | 00004067 | 00000023 | 00002c07 | 007598a3 | 000002e3 | 00002aff | 2954004c | 0002438a | 56f8671c | 682c46ec |
| 1656740 | 4790001c | 47e43380 | 0024247c | 0007fccc | 00283410 | 00203e70 | 002439f8 | 000a6800 | 002433d8 | 3e700020 | 3af4001c | 000a6800 |
| 1657020 | 001c38e8 | 3d6c2330 | 000eb314 | 000e9614 | 00000118 | b27cb66c | 00000623 | 00000642 | 000e93d4 | 02000ce5 | 05001b0d | 000047c7 |
| 1657100 | 00000013 | 00002c07 | 0076a163 | 000002e3 | 00002aff | 000e9408 | 00000038 | b27cb66c | 0000062e | 00000643 | 000e940c | 02000ce5 |
| 1657160 | 05001b0d | 000047cf | 0000001b | 00002c07 | 0076a443 | 000002e3 | 00002aff | 000e9440 | 00000038 | b27cb66c | 0000062f | 00000644 |
| 1657240 | 000e9444 | 02000ce5 | 05001b0d | 000047d7 | 0000001b | 00002c07 | 0076a7e3 | 000002e3 | 00002aff | 000e9478 | 00000038 | b27cb66c |
| 1657320 | 00000630 | 00000645 | 000e947c | 02000ce5 | 05001b0d | 00003b77 | 0000002b | 00002c07 | 00646a43 | 000002e3 | 00002aff | 000e9614 |
| 1657400 | 00000038 | b27cb66c | 00000631 | 00000646 | 000e9618 | 02000ce5 | 05001b01 | 00003eaf | 0000001b | 00002c07 | 00663163 | 000002e3 |
| 1657460 | 00002aff | 2c780164 | 0002438a | 45d046ec | 474043e4 | 01003a6f | 5fa043c0 | 02000cdf | 4b8c0000 | 00002c07 | 6bb4247c | 000803ec |
| 1657540 | 002c43e4 | 01003a6f | 6j9443c0 | 02000cdf | 4b8c0000 | 00002c07 | 6bb4247c | 0007eb8c | 002c32d4 | 24d00000 | 000c652c | 002c3410 |
| 1657620 | 002041e8 | 00003637 | 45806d50 | 53704538 | 61946c34 | 45806dd8 | 6b744538 | 4b8c0000 | 000047df | 6c34247c | 000cf3e0 | 002c2e7c |
| 1657700 | ae740028 | 2ba0002c | 002c3260 | 001834a0 | 00243858 | 38043aa0 | 000c8d48 | 002caa88 | 00282e98 | aa880024 | aaf00001 | ae74001c |
| 1657760 | 2c88000c | 2c58aab4 | 0000ae74 | 001c3844 | 42540000 | 00003637 | 45806e58 | 001c5370 | 45386e1c | 00206c34 | 24d00000 | 000cf3e0 |
| 1660040 | 002043e4 | 05003b77 | 61d86d94 | 6d506e58 | 001c6d0c | 447c0000 | 02000cdf | 4b8c0000 | 00002c07 | 6bb4247c | 0007ebcc | 001c43e4 |
| 1660120 | 010047df | 6dd843c0 | 030047e7 | 6bb46d94 | 615043e4 | 01001b77 | 6b7439a4 | 0007e68c | 001043e4 | 02003ac7 | 5f8c43c0 | 02000ce7 |
| 1660200 | 6bb44af8 | 00001f17 | 44a00000 | 01001b77 | 6b742340 | 0007e68c | 000e9688 | 00000038 | b27cb66c | 00000632 | 00000647 | 000e968c |
| 1660260 | 02000ce5 | 05001b0d | 000047ef | 0000001b | 00002c07 | 0076ad23 | 000002e3 | 00002aff | 2c78003c | 0002438a | 45b8370c | 00184768 |
| 1660340 | 32443228 | 336439a4 | 000c8d48 | 001c2ecc | 332c40a0 | 000ed5c4 | 0018394c | 00183244 | 32283d30 | 24200000 | 000c8d48 | 000e9700 |
| 1660420 | 00000038 | b27cb66c | 00000633 | 00000648 | 000e9704 | 02000ce5 | 05001b0d | 000047f7 | 00000013 | 00002c07 | 0076ae23 | 000002e3 |
| 1660500 | 00002aff | 000da6cd | 000ed650 | 000ed668 | 000ed6b8 | 00000000 | 000ed6d0 | 000ed6e8 | 000ed768 | 000ed755 | 000ed730 | 00000000 |
| 1660560 | 00000000 | 00000000 | 00000000 | 00000000 | 000db04d | 000e98b0 | 000000b0 | b27cb66c | 00000634 | 00000649 | 000e977c | 02000ce5 |
| 1660640 | 05001b0d | 0000480f | 00000013 | 00002c07 | 0076b423 | 000002e3 | 00002aff | 000e9778 | 00000040 | 000ed7fc | 000ed840 | 000ed884 |
| 1660720 | 000ed9a1 | 00000000 | 00000000 | 000ed9e1 | 000e8fac | 000e900d | 00000000 | 000e8eb8 | 000e8d60 | 000da129 | 00000000 | 000e98b0 |
| 1661000 | 00000038 | b27cb66c | 00000635 | 0000064a | 000e98b4 | 02000ce5 | 05001b0d | 00003bd7 | 00000013 | 00002c07 | 00647163 | 000002e3 |
| 1661060 | 00002aff | 29c4006c | 000e9818 | 45c43244 | 24d00000 | 000c652c | 001c3348 | 41080000 | 000c6768 | 00182ba0 | 00180020 | 34c00018 |
| 1661140 | 32443228 | 42540000 | 00003eb7 | 3bf40000 | 000c8d48 | 00182c88 | 001e2c58 | 34c00018 | 32443228 | 42540000 | 00003f2f | 40f40000 |
| 1661220 | 000c8d48 | 001437f0 | 3cf4234c | 0007e68c | 29540094 | 0002438a | 45c432f0 | 0020247c | 000c652c | 00243410 | 001c3364 | 40b40020 |
| 1661300 | 000ed7ec | 00202ecc | 2ba00020 | 001037f0 | 34f4001c | 242c0000 | 0007e68c | 2c583348 | 41080000 | 000c6768 | 00182ba0 | 00180020 |
| 1661360 | 34c00018 | 32443228 | 42540000 | 00003eb7 | 3bf40000 | 000c8d48 | 00182c88 | 001e2c58 | 34c00018 | 32443228 | 42540000 | 00003f2f |
| 1661440 | 40f40000 | 000c8d48 | 001437f0 | 3cf4234c | 0007e68c | 000e99bc | 00000070 | b27cb66c | 00000636 | 0000064b | 000e98ec | 02000ce5 |
| 1661520 | 05001b0d | 00004817 | 0000001b | 00002c07 | 0076ac23 | 000002e3 | 00002aff | 000e99bc | 00000038 | b27cb66c | 00000637 | 0000064c |
| 1661600 | 000e99c0 | 02000ce5 | 05001b0d | 0000481f | 0000001b | 00002c07 | 0076bf63 | 000002e3 | 00002aff | 2c78009c | 0002438a | 45dc46d8 |
| 1661660 | 47682e7c | ae740024 | 2ba00028 | 00543540 | 00180020 | 324433bc | 42540000 | 000033bf | 3c480000 | 000c8d48 | 0028aa88 | 00242e98 |
| 1661740 | 44a00000 | 0100343f | 6af0001c | 40b40020 | 0007e68c | 0020394c | 00183244 | 3894001c | 42540000 | 0000343f | 24200000 | 000c8d48 |
| 1662020 | 2c583260 | 00183244 | 33bc41e8 | 00003f2f | 3c480000 | 000c8d48 | 0018394c | 00183244 | 3d6041e8 | 00001eb7 | 24200000 | 000c8d48 |
| 1662100 | 000e9a78 | 00000038 | b27cb66c | 00000638 | 0000064d | 000e9a7c | 02000ce5 | 05001b0d | 00004827 | 00000013 | 00002c07 | 0076c3a3 |
| 1662160 | 000002e3 | 00002aff | 27f0004c | 000ed894 | 45dc4700 | 3280247c | 000c652c | 001c33bc | 42540000 | 000006df | 45806dd8 | 53704538 |
| 1662240 | 4b8c0000 | 0000406f | 6c34247c | 000cf3e0 | 00183260 | 00183244 | 396c3d30 | 3cf4234c | 000c8d48 | 29540038 | 0002438a | 252046ec |
| 1662320 | 32b8247c | 000c652c | 00183310 | 40f40000 | 000c6768 | 00143260 | 00183244 | 385841e8 | 00003b97 | 3cf4234c | 000c8d48 | 000e9b84 |
| 1662400 | 00000038 | b27cb66c | 00000639 | 0000064e | 000e9b88 | 02000ce5 | 05001b0d | 0000482f | 0000001b | 00002c07 | 0076c7a3 | 000002e3 |
| 1662460 | 00002aff | 27f00074 | 000ed944 | 45e80024 | 47280020 | 47543244 | 24d00000 | 000c652c | 00283410 | 001c41e8 | 000006df | 45806e1c |
| 1662540 | 00245370 | 45384af8 | 0000406f | 6c34247c | 000cf3e0 | 00243500 | 00183244 | 38940020 | 3e70001c | 41080000 | 000c8d48 | 001843e4 |
| 1662620 | 02004047 | 69b05fa0 | 40f40000 | 0007e68c | 00142330 | 000ed934 | 29540060 | 0002438a | 25204728 | 001c4754 | 32f00020 | 24d00000 |
| 1662700 | 000c652c | 00243364 | 40b40020 | 000c6768 | 00203500 | 00183244 | 3894001c | 42540000 | 0000483f | 41080000 | 000c8d48 | 001843e4 |
| 1662760 | 02004047 | 69b05fa0 | 40f40000 | 0007e68c | 00142330 | 000ed934 | 000e9d00 | 00000038 | b27cb66c | 0000063a | 0000064f | 000e9d04 |
| 1663040 | 02000ce5 | 05001b0d | 00003caf | 00000013 | 00002c07 | 0064cba3 | 000002e3 | 00002aff | 27f00030 | 000e9be8 | 45c44700 | 394c0018 |
| 1663120 | 32443228 | 320c3280 | 24d00000 | 000c8d48 | 0018386c | 37f03cf4 | 242c0000 | 000ed9b8 | 28c40074 | 000e9c5c | 45c4370c | 00183244 |
| 1663200 | 3228320c | 32d4247c | 000c8d48 | 001c3348 | 41080000 | 000c6768 | 00182ba0 | 00180020 | 34c00018 | 32443228 | 42540000 | 00003eb7 |
| 1663260 | 3bf40000 | 000c8d48 | 00182c88 | 001e2c58 | 34c00018 | 32443228 | 42540000 | 00003f2f | 40f40000 | 000c8d48 | 001437f0 | 3cf4234c |
| 1663340 | 0007e68c | 295400a0 | 0002438a | 45c4370c | 00183244 | 3228320c | 32f00020 | 24d00000 | 000c8d48 | 00243410 | 001c3364 | 40b40020 |

| | | | | | | | | | | | | |
|---|---|---|---|---|---|---|---|---|---|---|---|---|
| 1663420 | 000ed7ec | 00202ecc | 2ba00020 | 001037f0 | 3df4001c | 242c0000 | 0007e68c | 2c583348 | 41080000 | 000c6768 | 00182ba0 | 00180020 |
| 1663500 | 34c00018 | 32443228 | 42540000 | 00003eb7 | 3bf40000 | 000c8d48 | 00182c88 | 001e2c58 | 34c00014 | 32443228 | 42540000 | 00003f2f |
| 1663560 | 40f40000 | 000c8d48 | 001437f0 | 3cf4234c | 0007e68c | 000e9f8c | 000000f0 | b27cb66c | 0000063b | 00000650 | 000e9d3c | 02000ce5 |
| 1663640 | 05001b0d | 00004847 | 0000001b | 00002c07 | 0076cdc3 | 000002e3 | 00002aff | 000e9d70 | 00000038 | b130b66c | 0000063c | 00000651 |
| 1663720 | 000e92b5 | 02000ce5 | 05001b0d | 0000484f | 00000013 | 00002c07 | 0076d323 | 000002e3 | 00002aff | 000e9f8c | 00000080 | 000ed7fc |
| 1664000 | 000ed840 | 000ed884 | 000ed704 | 00000000 | 00000000 | 000ed9c8 | 000eda74 | 00000000 | 00000000 | 00000000 | 00000000 | 000e8da0 |
| 1664060 | 00000000 | 00000000 | 00000000 | 00000000 | 00000000 | 00000000 | 000ed9a1 | 00000000 | 00000000 | 000e8ed8 | 000e8fac | 000e900d |
| 1664140 | 00000000 | 00000000 | 000e8d60 | 000daca4 | 00000000 | 2c78009c | 0002438a | 45c446d8 | 2ba0001c | 005032d4 | 24d00000 | 000c652c |
| 1664220 | 001c2ecc | 2ba0001c | 00183260 | 00183244 | 385841e8 | 00003407 | 3d18234c | 000c8d48 | 2c583348 | 41080000 | 000c6768 | 00183260 |
| 1664300 | 00183244 | 385841e8 | 00003407 | 3d0c234c | 000c8d48 | 2c5842ac | 00004857 | 00080d0c | 001439f8 | 00080d0c | 001042ac | 00003ad7 |
| 1664360 | 00080d0c | 001039a4 | 00090d0c | 000c42ac | 0000485f | 00080d0c | 000c234c | 0007fd0c | 00000000 | 000cfb14 | 000e0288 | 00000000 |
| 1664440 | 00000000 | 000bda88 | 00000000 | 00000000 | 00000000 | 000a18a4 | 00000000 | 000da555 | 00000000 | 00000000 | 00000000 | 000ed9d9 |
| 1664520 | 00000000 | 000a60fd | 000bdad8 | 00000000 | 000aa95c | 000ed840 | 00000000 | 000a6810 | 00000000 | 000db118 | 000cf84d | 00000000 |
| 1664600 | 000da53c | 00000000 | 000b0b7c | 00000000 | 00000000 | 00000000 | 00000000 | 000b0bac | 00000000 | 0009cbe8 | 00000000 | 00000000 |
| 1664660 | 00000000 | 000e8f6c | 000b5285 | 000c9125 | 00000000 | 000ca255 | 00000000 | 00000000 | 000b7624 | 00000000 | 00000000 | 000d0330 |
| 1664740 | 00000000 | 00000000 | 000e8e40 | 00000000 | 000bdcd0 | 00000000 | 00000000 | 000a19b0 | 00000000 | 00000000 | 00000000 | 00000000 |
| 1665020 | 000eb464 | 00001198 | 000e9fa2 | 0200088f | 00001023 | 000e84bd | 000e9f95 | 000e9fb2 | 0100088f | 00001c03 | 000e9fa9 | 000e9fc6 |
| 1665100 | 0200088f | 00001023 | 000e8519 | 000e9fb9 | 000e9fd6 | 0100088f | 00001c03 | 000e9fcd | 000e9fea | 0200088f | 00001023 | 000e8575 |
| 1665160 | 000e9fdd | 000e9ffa | 0100088f | 00001c03 | 000e9ff1 | 000ea00a | 0100088f | 00000ff3 | 000ea001 | 000ea01a | 0100088f | 00001183 |
| 1665240 | 000ea011 | 000ea02a | 0100088f | 00000f23 | 000ea021 | 000ea03a | 0100088f | 00000fc3 | 000ea031 | 000ea04a | 0100088f | 00001183 |
| 1665320 | 000ea041 | 000ea05e | 0200088f | 00000ed3 | 000e8651 | 000ea051 | 000ea072 | 0200088f | 00001173 | 000e867d | 000ea065 | 000ea086 |
| 1665400 | 0200088f | 00001bf3 | 000e86b9 | 000ea079 | 000ea09a | 0200088f | 00001b63 | 000e86e5 | 000ea08d | 000ea0b2 | 0300088f | 00000ee3 |
| 1665460 | 000e8739 | 000e8721 | 000ea0a1 | 000ea0c2 | 0100088f | 00000fe3 | 000ea0b9 | 000ea0d6 | 0200088f | 00001bf3 | 000e8789 | 000ea0c9 |
| 1665540 | 000ea0ea | 0200088f | 00001bf3 | 000e87dd | 000ea0dd | 000ea0fe | 0200088f | 00001023 | 000e8809 | 000ea0f1 | 000ea112 | 0200088f |
| 1665620 | 00000ed3 | 000e8831 | 000ea105 | 000ea126 | 0200088f | 00001b63 | 000e885d | 000ea119 | 000ea13e | 0300088f | 00000ee3 | 000e88b1 |
| 1665700 | 000e8899 | 000ea12d | 000ea152 | 0200088f | 000010c3 | 000e88c5 | 000ea145 | 000ea166 | 0200088f | 00001bf3 | 000e8901 | 000ea159 |
| 1665760 | 000ea176 | 0100088f | 00001083 | 000ea16d | 000ea18a | 0200088f | 00001023 | 000e8941 | 000ea17d | 000ea19a | 0100088f | 00000f43 |
| 1666040 | 000ea191 | 000ea1ae | 0200088f | 00000ed3 | 000e8971 | 000ea1a1 | 000ea1c2 | 0200088f | 00001b63 | 000e899d | 000ea1b5 | 000ea1da |
| 1666120 | 0300088f | 00000ee3 | 000e89f1 | 000e89d9 | 000ea1c9 | 000ea1ee | 0200088f | 000010c3 | 000e8a05 | 000ea1e1 | 000ea202 | 0200088f |
| 1666200 | 00001bf3 | 000e8a41 | 000ea1f5 | 000ea212 | 0100088f | 00001083 | 000ea209 | 000ea226 | 0200088f | 00000ed3 | 000e8a95 | 000ea219 |
| 1666260 | 000ea23a | 0200088f | 00001b63 | 000e8ac1 | 000ea22d | 000ea252 | 0300088f | 00000ee3 | 000e8b15 | 000e8afd | 000ea241 | 000ea266 |
| 1666340 | 0200088f | 000010c3 | 000e8b29 | 000ea259 | 000ea27a | 0200088f | 00001bf3 | 000e8b65 | 000ea261 | 000ea28a | 0100088f | 00001083 |
| 1666420 | 000ea281 | 000ea29e | 0200088f | 00000ed3 | 000e8bb9 | 000ea291 | 000ea2b2 | 0200088f | 00001173 | 000e8be5 | 000ea2a5 | 000ea2c6 |
| 1666500 | 0200088f | 00001bf3 | 000e8c21 | 000ea2b9 | 000ea2da | 0200088f | 00001b23 | 000e8c61 | 000ea2cd | 000ea2ee | 0200088f | 00000ed3 |
| 1666560 | 000e8c89 | 000ea2e1 | 000ea2fe | 0100088f | 00001033 | 000ea2f5 | 000ea312 | 0200088f | 00001bf3 | 000e8cf1 | 000ea305 | 000ea326 |
| 1666640 | 0200088f | 00001b23 | 000e8d31 | 000ea319 | 000ea33e | 0300088f | 00000ee3 | 000e8d71 | 000e8d59 | 000ea32d | 000ea356 | 0300088f |
| 1666720 | 00001b73 | 000e8d85 | 000e8d93 | 000ea345 | 000ea36e | 0300088f | 00000ee3 | 000e8dd9 | 000e8dc1 | 000ea35d | 000ea37e | 0100088f |
| 1667000 | 00001093 | 000ea375 | 000ea392 | 0200088f | 00001bf3 | 000e8e29 | 000ea385 | 000ea3a2 | 0100088f | 00001063 | 000ea399 | 000ea3b6 |
| 1667060 | 0200088f | 00001073 | 000e8e69 | 000ea3a9 | 000ea3ce | 0300088f | 00000ee3 | 000e8ea9 | 000e8e91 | 000ea3bd | 000ea3de | 0100088f |
| 1667140 | 00001083 | 000ea3d5 | 000ea3f2 | 0200088f | 00001bf3 | 000e8ef9 | 000ea3e5 | 000ea406 | 0200088f | 00001bf3 | 000e8f4d | 000ea3f9 |
| 1667220 | 000ea416 | 0100088f | 00001063 | 000ea40d | 000ea426 | 0100088f | 00000b33 | 000ea41d | 000ea43a | 0200088f | 00000373 | 000e8fd9 |
| 1667300 | 000ea42d | 000ea452 | 0300088f | 00000093 | 000dfdd5 | 000e706d | 000ea441 | 000ea46a | 0300088f | 00000413 | 000e9031 | 000e9039 |
| 1667360 | 000ea459 | 000ea47e | 0200088f | 000008c3 | 000e9059 | 000ea471 | 000ea492 | 0200088f | 00000693 | 000e9079 | 000ea485 | 000ea4a6 |
| 1667440 | 0200088f | 00000643 | 000e9099 | 000ea499 | 000ea4c2 | 0400088f | 00001bd3 | 000e90b9 | 000dfec5 | 000e6fe5 | 000ea4ad | 000ea4d6 |
| 1667520 | 0200088f | 000003c3 | 000e90d9 | 000ea4c9 | 000ea4ea | 0200088f | 00000873 | 000e90f9 | 000ea4dd | 000ea4fe | 0200088f | 00000643 |
| 1667600 | 000e9119 | 000ea4f1 | 000ea51a | 0400088f | 00000783 | 000e9139 | 000e0025 | 000e6f85 | 000ea505 | 000ea52a | 0100088f | 000000e3 |
| 1667660 | 000ea521 | 000ea53e | 0200088f | 00000373 | 000e9159 | 000ea531 | 000ea552 | 0200088f | 00000823 | 000e9179 | 000ea545 | 000ea56e |
| 1667740 | 0400088f | 00000783 | 000e9199 | 000e016d | 000e6f45 | 000ea559 | 000ea582 | 0200088f | 000003c3 | 000e91b9 | 000ea575 | 000ea596 |
| 1670020 | 0200088f | 00000873 | 000e91d9 | 000ea589 | 000ea5aa | 0200088f | 00000643 | 000e91f9 | 000ea59d | 000ea5ba | 0100088f | 00000243 |
| 1670100 | 000ea5b1 | 000ea5d2 | 0300088f | 00000093 | 000e025d | 000e6ee5 | 000ea5c1 | 000ea5e6 | 0200088f | 00000373 | 000e922d | 000ea5d9 |
| 1670160 | 000ea5fa | 0200088f | 00000823 | 000e924d | 000ea5ed | 000ea616 | 0400088f | 00000783 | 000e926d | 000e0389 | 000e6ea5 | 000ea601 |
| 1670240 | 000ea62e | 0300088f | 00000413 | 000e9285 | 000e928d | 000ea61d | 000ea642 | 0200088f | 000008c3 | 000e92ad | 000ea635 | 000ea656 |
| 1670320 | 0200088f | 00000693 | 000e92cd | 000ea649 | 000ea666 | 0100088f | 00000253 | 000ea65d | 000ea682 | 0400088f | 00001bd3 | 000e9301 |
| 1670400 | 000e0479 | 000e6e1d | 000ea66d | 000ea692 | 0100088f | 00000353 | 000ea689 | 000ea6a6 | 0200088f | 00000823 | 000e9341 | 000ea699 |
| 1670460 | 000ea6c2 | 0400088f | 00000783 | 000e9361 | 000e05d9 | 000e6ddd | 000ea6ad | 000ea6d2 | 0100088f | 00000683 | 000ea6c9 | 000ea6e2 |

| | | | | | | | | | | | | |
|---|---|---|---|---|---|---|---|---|---|---|---|---|
| 1670540 | 0100088f | 00000803 | 000ea6d9 | 000ea6fa | 0300088f | 00000753 | 000e06c9 | 000e6d9d | 000ea6e9 | 000ea70a | 0100088f | 00000653 |
| 1670620 | 000ea701 | 000ea71e | 0200088f | 00000933 | 000e9401 | 000ea711 | 000ea732 | 0200088f | 00000923 | 000e9421 | 000ea725 | 000ea746 |
| 1670700 | 0200088f | 00000043 | 000e07ad | 000ea739 | 00000007 | 00001073 | 000e8e15 | 000ea749 | 000ea76a | 0200088f | 00001073 | 000e8e29 |
| 1670760 | 000ea75d | 000ea782 | 0300088f | 00000ee3 | 000e8e69 | 000e8e51 | 000ea771 | 000ea79a | 0300088f | 00001b73 | 000e8e7d | 000e8e91 |
| 1671040 | 000ea789 | 000ea7b2 | 0300088f | 00000ee3 | 000e8ed1 | 000e8eb9 | 000ea7a1 | 000ea7c2 | 0100088f | 00001083 | 000ea7b9 | 000ea7d6 |
| 1671120 | 0200088f | 00001bf3 | 000e8f21 | 000ea7c9 | 000ea7ea | 0200088f | 00001073 | 000e8f4d | 000ea7dd | 000ea7fa | 0100088f | 00001063 |
| 1671200 | 000ea7f1 | 000ea812 | 0300088f | 00000ee3 | 000e8fa1 | 000e8f89 | 000ea801 | 000ea826 | 0200088f | 00001073 | 000e8fb5 | 000ea819 |
| 1671260 | 000ea83a | 0200088f | 00001023 | 000e8fc9 | 000ea82d | 000ea84e | 0200088f | 00001bf3 | 000e9005 | 000ea841 | 000ea862 | 0200088f |
| 1671340 | 00001073 | 000e9031 | 000ea855 | 000ea876 | 0200088f | 00000fd3 | 000e9045 | 000ea869 | 000ea886 | 0100088f | 00001063 | 000ea874 |
| 1671420 | 000ea89a | 0200088f | 00000f33 | 000e908d | 000ea88d | 000ea8ae | 0200088f | 00001073 | 000e90a1 | 000ea8a1 | 000ea8be | 0100088f |
| 1671500 | 00001c03 | 000ea8b5 | 000ea8d2 | 0200088f | 00001073 | 000e90fd | 000ea8c5 | 000ea8e2 | 0100088f | 00001183 | 000ea8d9 | 000ea8f6 |
| 1671560 | 0200088f | 00000f33 | 000e9139 | 000ea8e9 | 000ea90e | 0300088f | 00001b73 | 000e914d | 000e9161 | 000ea8fd | 000ea926 | 0300088f |
| 1671640 | 00000ee3 | 000e91a1 | 000e9189 | 000ea915 | 000ea93e | 0300088f | 00001b73 | 000e91b5 | 000e91c9 | 000ea92d | 000ea956 | 0300088f |
| 1671720 | 00000ee3 | 000e9209 | 000e91f1 | 000ea945 | 000ea96a | 0200088f | 00001073 | 000e921d | 000ea95d | 000ea97e | 0200088f | 00001bf3 |
| 1672000 | 000e9259 | 000ea971 | 000ea992 | 0200088f | 00001073 | 000e9285 | 000ea985 | 000ea9a6 | 0200088f | 00001173 | 000e9299 | 000ea999 |
| 1672060 | 000ea9ba | 0200088f | 00001073 | 000e92ad | 000ea9ad | 000ea9ce | 0200088f | 00001073 | 000e92c1 | 000ea9c1 | 000ea9de | 0100088f |
| 1672140 | 00001063 | 000ea9d5 | 000ea9f6 | 0300088f | 00000ee3 | 000e9315 | 000e92fd | 000ea9e5 | 000eaa0e | 0300088f | 00001b73 | 000e9329 |
| 1672220 | 000e933d | 000ea9fd | 000eaa26 | 0300088f | 00000ee3 | 000e937d | 000e9365 | 000eaa15 | 000eaa36 | 0100088f | 00001033 | 000eaa2d |
| 1672300 | 000eaa4a | 0200088f | 00001bf3 | 000e93cd | 000eaa3d | 000eaa5e | 0200088f | 00001073 | 000e93f9 | 000eaa51 | 000eaa72 | 0200088f |
| 1672360 | 00001073 | 000e940d | 000eaa65 | 000eaa8a | 0300088f | 00000ee3 | 000e944d | 000e9435 | 000eaa79 | 000eaaa2 | 0300088f | 00001b73 |
| 1672440 | 000e9461 | 000e9475 | 000eaa91 | 000eaaba | 0300088f | 00000ee3 | 000e94b5 | 000e949d | 000eaaa9 | 000eaace | 0200088f | 000010c3 |
| 1672520 | 000e94c9 | 000eaac1 | 000eaae2 | 0200088f | 00001bf3 | 000e9505 | 000eaad5 | 000eaaf6 | 0200088f | 00001073 | 000e9531 | 000eaae9 |
| 1672600 | 000eab0e | 0300088f | 00000ee3 | 000e9571 | 000e9559 | 000eaafd | 000eab1e | 0100088f | 000010b3 | 000eab15 | 000eab32 | 0200088f |
| 1672660 | 00001bf3 | 000e95c1 | 000eab25 | 000eab46 | 0200088f | 00001073 | 000e95ed | 000eab39 | 000eab5a | 0200088f | 00001073 | 000e9601 |
| 1672740 | 000eab4d | 000eab6e | 0200088f | 00000f33 | 000e9635 | 000eab61 | 000eab82 | 0200088f | 00000fd3 | 000e9649 | 000eab75 | 000eab92 |
| 1673020 | 0100088f | 00001183 | 000eab89 | 000eabaa | 0300088f | 00000ee3 | 000e9691 | 000e9679 | 000eab99 | 000eabba | 0100088f | 00001083 |
| 1673100 | 000eabb1 | 000eabce | 0200088f | 00001bf3 | 000e96e1 | 000eabc1 | 000eabe2 | 0200088f | 00001073 | 000e970d | 000eabd5 | 000eabf2 |
| 1673160 | 0100088f | 00001063 | 000eabe9 | 000eac02 | 0100088f | 00000b23 | 000eabf9 | 000eac16 | 0200088f | 00000373 | 000e9781 | 000eac09 |
| 1673240 | 000eac2e | 0300088f | 00000093 | 000e0635 | 000e72d1 | 000eac1d | 000eac42 | 0200088f | 000003c3 | 000e97e1 | 000eac35 | 000eac56 |
| 1673320 | 0200088f | 00000873 | 000e9801 | 000eac49 | 000eac6a | 0200088f | 00000643 | 000e9821 | 000eac5d | 000eac86 | 0400088f | 00000783 |
| 1673400 | 000e9841 | 000e0725 | 000e7271 | 000eac71 | 000eac9a | 0200088f | 00000373 | 000e9861 | 000eac8d | 000eacae | 0200088f | 00000823 |
| 1673460 | 000e9881 | 000eaca1 | 000eacca | 0400088f | 00000783 | 000e98a1 | 000e0851 | 000e7231 | 000eacb5 | 000eacda | 0100088f | 00000343 |
| 1673540 | 000eacd1 | 000eacee | 0200088f | 00000823 | 000e98e1 | 000eace1 | 000ead06 | 0300088f | 00000773 | 000e0941 | 000e71f1 | 000eacf5 |
| 1673620 | 000ead16 | 0100088f | 00000673 | 000ead0d | 000ead26 | 0100088f | 000007f3 | 000ead1d | 000ead3a | 0200088f | 00000053 | 000e0a25 |
| 1673700 | 000ead2d | 00000007 | 01001eaf | 0067e2a3 | 000e9741 | 000ead42 | 000e9729 | 000ead4a | 000e9729 | 000ead4a | 000e9729 | 000ead4a |
| 1673760 | 000ead71 | 000ead4a | 0200088f | 000000a7 | 000e9721 | 000ead71 | 000ead4a | 000e96d9 | 000ead7e | 000e96c1 | 000ead86 | 000e96c1 |
| 1674040 | 000ead86 | 000e96c1 | 000ead86 | 000e9685 | 000ead9e | 000eadb5 | 000ead9e | 0300088f | 0000007f | 000e967d | 000e9691 | 000eadb5 |
| 1674120 | 000ead9e | 000e9659 | 000eadc6 | 000e9659 | 000eadc6 | 000e9659 | 000eadc6 | 000e961d | 000eaddc | 000eadf5 | 000eadde | 0300088f |
| 1674200 | 0000007f | 000e9615 | 000e9629 | 000eadf5 | 000eadde | 000e95f5 | 000eae06 | 000e95e1 | 000eae0e | 000e95cd | 000eae16 | 000e95b5 |
| 1674260 | 000eae1e | 000e95b5 | 000eae1e | 000e95b5 | 000eae1e | 000eae45 | 000eae1e | 0200088f | 000000a7 | 000e95ad | 000eae45 | 000eae1e |
| 1674340 | 000e9565 | 000eae52 | 000e954d | 000eae5a | 000e954d | 000eae5a | 000e954d | 000eae5a | 000e9511 | 000eae72 | 000eae89 | 000eae72 |
| 1674420 | 0300088f | 0000007f | 000e9509 | 000e951d | 000eae89 | 000eae72 | 000e94e5 | 000eae9a | 000e94e5 | 000eae9a | 000e94e5 | 000eae9a |
| 1674500 | 000e94a9 | 000eaeb2 | 000eaec9 | 000eaeb2 | 0300088f | 0000007f | 000e94a1 | 000e94b5 | 000eaec9 | 000eaeb2 | 000e9481 | 000eaeda |
| 1674560 | 000e9481 | 000eaeda | 000e9481 | 000eaeda | 000e9459 | 000eaef2 | 000e9445 | 000eaefa | 000e9431 | 000eaf02 | 000e9431 | 000eaf02 |
| 1674640 | 000e9431 | 000eaf02 | 000eaf29 | 000eaf02 | 0100088f | 000000c7 | 000eaf29 | 000eaf02 | 000e93e9 | 000eaf32 | 000e93d5 | 000eaf3a |
| 1674720 | 000e93d5 | 000eaf3a | 000e93d5 | 000eaf3a | 000eaf61 | 000eaf3a | 0100088f | 000000c7 | 000eaf61 | 000eaf3a | 000e938d | 000eaf6a |
| 1675000 | 000e9379 | 000eaf72 | 000e9379 | 000eaf72 | 000e9379 | 000eaf72 | 000eaf99 | 000eaf72 | 0100088f | 000000c7 | 000eaf99 | 000eaf72 |
| 1675060 | 000e9331 | 000eafa2 | 000e931d | 000eafaa | 000e931d | 000eafaa | 000e931d | 000eafaa | 000eafd1 | 000eafaa | 0100088f | 000000c7 |
| 1675140 | 000eafd1 | 000eafaa | 000e92d5 | 000eafda | 000e92c1 | 000eafe2 | 000e92c1 | 000eafe2 | 000e92c1 | 000eafe2 | 000eb009 | 000eafe2 |
| 1675220 | 0100088f | 000000c7 | 000eb009 | 000eafe2 | 000e9279 | 000eb012 | 000e9265 | 000eb01a | 000e9265 | 000eb01a | 000e9265 | 000eb01a |
| 1675300 | 000e9231 | 000eb032 | 000eb049 | 000eb032 | 0300088f | 0000007f | 000e9229 | 000e923d | 000eb049 | 000eb032 | 000e9209 | 000eb05a |
| 1675360 | 000e91f1 | 000eb062 | 000e91f1 | 000eb07a | 000e9209 | 000eb082 | 000eb049 | 000eb08a | 000e9265 | 000eb092 | 000e9279 | 000eb09a |
| 1675440 | 000eb009 | 000eb0a2 | 000eb0a9 | 000eafda | 0200088f | 000006af | 000e92e1 | 0200088f | 00000ea3 | 000e91e9 | 000eb0b5 | 000eb0d6 |
| 1675520 | 0200088f | 00001173 | 000e9215 | 000eb0c9 | 000eb0e6 | 0100088f | 00001a23 | 000eb0dd | 000eb0f6 | 0100088f | 00000ef3 | 000eb0ed |
| 1675600 | 000eb106 | 0100088f | 00000f93 | 000eb0fd | 000eb116 | 0100088f | 00001c03 | 000eb10d | 000eb12a | 0200088f | 29540018 | 0002438a |

| | | | | | | | | | | | | |
|---|---|---|---|---|---|---|---|---|---|---|---|---|
| 1675660 | 57b8638c | 373c0018 | 239c0000 | 000e8d30 | 001e2072 | 65706561 | 74656420 | 696e2065 | 6e756d65 | 72617469 | 6f6e2074 | 79706520 |
| 1675740 | 00001c03 | 000e6368 | 61726163 | 7465725f | 74797065 | 000e9399 | 000cf1b8 | 01004767 | 00002c07 | 00000004 | 000eb190 | 000da0f8 |
| 1676020 | 0001005b | 00000000 | 27f00020 | 000da0f8 | 25203310 | 24d00000 | 000eb1c0 | 00103cf4 | 242c0000 | 000eb1e0 | 000df75c | 0200352f |
| 1676100 | 00002c07 | 00000008 | 000939e0 | 000939e0 | 00000000 | 00000000 | 000b856c | 0100476f | 00002c07 | 00000004 | 000eb24c | 000eb24c |
| 1676160 | 0001005b | 00000000 | 00193a20 | 6e6f7420 | 616e2065 | 6e756d65 | 72617469 | 6f6e2074 | 79706500 | 00146e6f | 74206120 | 63686172 |
| 1676240 | 61637465 | 72207479 | 70650015 | 27f00028 | 000eb270 | 4e1c0000 | 00000007 | 30502520 | 43000000 | 0000477f | 00080d0c | 000c234c |
| 1676320 | 0007fd0c | 2cacb25e | 0002438a | 2ca00f43 | 00000000 | 00000001 | 000eb224 | 000eb288 | 000e90e8 | 000e6c70 | 28c40018 | 000eb288 |
| 1676400 | 56f8671c | 5fa05aec | 0100433f | 5fa0228c | 29540014 | 0002438a | 56f85fa0 | 671c22bc | 000eb1e0 | 000b87d0 | 03004787 | 00002c07 |
| 1676460 | 0000000c | 000e7004 | 000eb2dc | 0001005b | 00000000 | 000b8850 | 0400478f | 00002c07 | 00000010 | 000eb324 | 000eb324 | 0001005b |
| 1676540 | 00000000 | 29540028 | 0002438a | 30502520 | 24d00000 | 00080d0c | 000c42ac | 00004777 | 00080d0c | 000c234c | 0007fd0c | 000cf3d0 |
| 1676620 | 04004067 | 00002c07 | 00000010 | 000ed3f4 | 000ed3f4 | 0001005c | 00000000 | 2cac088f | 0002438a | 2ca09761 | 00000000 | 00000001 |
| 1676700 | 000e706c | 000eb35c | 000e90c4 | 000e9030 | 28c40014 | 000eb35c | 56f8671c | 5fa048f8 | 49c8228c | 29540020 | 0002438a | 56f85fa0 |
| 1676760 | 671cbfcc | a890aaf0 | 0001ac90 | 239c0000 | 000eb2cc | 000e6869 | 65722f68 | 69657266 | 756e6373 | 00000000 | 27f00012 | 000ed460 |
| 1677040 | 4e1c0000 | 00000007 | 228cb37c | 000eb39c | 00000000 | 00282f68 | 6f6d652f | 6f736173 | 312f612f | 73726565 | 2f73656d | 616e7469 |
| 1677120 | 635f6368 | 65636b31 | 2f726573 | 657400ff | 002b2f68 | 6f6d652f | 6f736173 | 312f612f | 73726565 | 2f73656d | 616e7469 | 635f6368 |
| 1677200 | 65636b31 | 2f726573 | 65742e70 | 6c00666f | 0000002c | 000edb54 | b27cb66c | 00000654 | 7fffffff | 000e91b8 | 02000ce5 | 0200293d |
| 1677260 | 0000487f | 000002eb | 00002aff | 0000002c | 000edb80 | b27cb66c | 0000065a | 7fffffff | 000e9210 | 02000ce5 | 02001f6d | 0000487f |
| 1677340 | 00002c07 | 00002aff | 000eb690 | 000000a4 | 000f4ce0 | 7fffffff | 000edba4 | 000eb4a4 | 0000002c | b27cb66c | 00000656 | 00000659 |
| 1677420 | 0909cbc1 | 02000ce5 | 02002385 | 0000487f | 00002c07 | 00002aff | 000eb4dc | 00000038 | b130b66c | 00000657 | 0000065b | 000eb4e1 |
| 1677500 | 02000ce5 | 05001b0d | 0000486f | 00000003 | 00002c07 | 0077d843 | 000002eb | 00002aff | 000eb690 | 0000002c | b4f0b4e4 | 00000656 |
| 1677560 | 7fffffff | 0007eaad | 00000000 | 00000000 | 000eb4a8 | 0002438a | 000ed610 | 2c780188 | 0002438a | 252043e4 | 0100343f | 5fa043c0 |
| 1677640 | 02000cdf | 4b8c0000 | 00002c07 | 6bb4247c | 0008042c | 000c43e4 | 020033bf | 5f8c43c0 | 02000cdf | 4b8c0000 | 00002c07 | 6bb4247c |
| 1677720 | 0008042c | 000c43e4 | 0300344f | 5f7843c0 | 02000cdf | 4b8c0000 | 00002c07 | 6bb4247c | 0008042c | 000c43e4 | 0200344f | 5f8c43c0 |
| 1700000 | 02000cdf | 4b8c0000 | 00002c07 | 6bb4247c | 0008042c | 000c43e4 | 0100344f | 5fa043c0 | 02000cdf | 4b8c0000 | 00002c07 | 6bb4247c |
| 1700060 | 0008042c | 000c43e4 | 02003ae7 | 5f8c43c0 | 02000cdf | 4b8c0000 | 00002c07 | 6bb4247c | 0008042c | 000c43e4 | 02003abf | 5f8c43c0 |
| 1700140 | 02000cdf | 4b8c0000 | 00002c07 | 6bb4247c | 0008042c | 000c43e4 | 02003ff7 | 5f8c43c0 | 02000cdf | 4b8c0000 | 00002c07 | 6bb4247c |
| 1700220 | 0008042c | 000c43e4 | 02004887 | 5f8c43c0 | 02000cdf | 4b8c0000 | 00002c07 | 6bb4247c | 0008042c | 000c43e4 | 0100488f | 5fa043c0 |
| 1700300 | 02000cdf | 4b8c0000 | 00002c07 | 6bb4247c | 0008042c | 000c43e4 | 03003507 | 5f7843c0 | 02000cdf | 4b8c0000 | 00002c07 | 6bb4247c |
| 1700360 | 0008042c | 000c43e4 | 03003a37 | 5f7843c0 | 02000cdf | 4b8c0000 | 00002c07 | 6bb4234c | 0008042c | 000edbe8 | 00001d28 | 64756c65 |
| 1700440 | 5f636f75 | 6e742843 | 3129292c | 20726574 | 72616374 | 286d6f64 | 756c655f | 636f756e | 74284329 | 29292c0a | 09090909 | 6661696c |
| 1700520 | 3b0a0909 | 09097472 | 75652e0a | 2a2f0a0a | 3a2d2064 | 796e616d | 69632064 | 65736967 | 6e5f756e | 69742f35 | 2e0a0a63 | 72656174 |
| 1700600 | 5f6d6f64 | 756c6528 | 50726566 | 69782c4e | 616d652c | 4d6f6475 | 6c654e61 | 6d652920 | 3a2d200a | 09090909 | 72657472 | 61637428 |
| 1700660 | 63757272 | 656e745f | 6d6f6475 | 6c655f70 | 72656669 | 78285f29 | 292c2061 | 73736572 | 74286375 | 7272656e | 745f6d6f | 64756c65 |
| 1700740 | 5f707265 | 66697828 | 50726566 | 69782929 | 2c0a0909 | 0909616e | 616c797a | 696e675f | 756e6974 | 5f6e756d | 28556e29 | 2c20636f |
| 1701020 | 6e636174 | 5f6e616d | 6573285b | 756e6974 | 2c556e2c | 50726566 | 69782c4e | 616d655d | 2c275f27 | 2c44756e | 292c0a09 | 09090928 |
| 1701100 | 64657369 | 676e5f75 | 6e697428 | 556e2c50 | 72656669 | 782c4e61 | 6d652c43 | 6f756e74 | 2c5f2920 | 2d3e0a09 | 09090909 | 436f756e |
| 1701160 | 74312069 | 7320436f | 756e7420 | 2b20313b | 20436f75 | 6e743120 | 69732030 | 292c0a09 | 09090963 | 6f6e6361 | 745f6e61 | 6d657328 |
| 1701240 | 5b44756e | 2c436f75 | 6e74315d | 2c275f27 | 2c4d6f64 | 756c654e | 616d6529 | 2c0a0909 | 09096173 | 73657274 | 61286465 | 7369676e |
| 1701320 | 5f756e69 | 7428556e | 2c507265 | 6669782c | 4e616d65 | 2c436f75 | 6e74312c | 4d6f6475 | 6c654e61 | 6d652929 | 2c200a09 | 0909094d |
| 1701400 | 6f64756c | 654e616d | 653a6173 | 73657274 | 28646573 | 69676e5f | 656e7469 | 74792875 | 6e697428 | 556e292c | 50726566 | 69782c4e |
| 1701460 | 616d6529 | 292c0a09 | 0909094d | 6f64756c | 654e616d | 653a6173 | 73657274 | 28287673 | 285f2c5f | 29203a2d | 20666169 | 6c29292e |
| 1701540 | 200a0a2f | 2a20616e | 63657374 | 6f722d70 | 6172656e | 742d6368 | 696c6472 | 656e202a | 2f0a0a70 | 6172656e | 7428556e | 2c436869 |
| 1701620 | 6c642c50 | 6172656e | 7429203a | 2d206465 | 7369676e | 5f756e69 | 7428556e | 2c437072 | 65666978 | 2c5f2c5f | 2c436869 | 6c64292c |
| 1701700 | 29212c20 | 70617265 | 6e745f6f | 66284370 | 72656669 | 782c5070 | 72656669 | 78292c0a | 09090964 | 65736967 | 6e5f756e | 69742855 |
| 1701760 | 6e2c5070 | 72656669 | 782c5f2c | 5f2c5061 | 72656e74 | 292e0a0a | 0a706172 | 656e745f | 6f662870 | 726f6365 | 73732c61 | 72636869 |
| 1702040 | 74656374 | 75726529 | 2e0a7061 | 72656e74 | 5f6f6628 | 66756e63 | 61726368 | 69746563 | 74757265 | 2c617263 | 68697465 | 63747572 |
| 1702120 | 65292e0a | 70617265 | 6e745f6f | 66286675 | 6e637072 | 6f636573 | 732c7072 | 6f636573 | 73292e0a | 70617265 | 6e745f6f | 66286675 |
| 1702200 | 6e637061 | 636b6167 | 65646563 | 6c2c7061 | 636b6167 | 65646563 | 6c292e0a | 70617265 | 6e745f6f | 66286675 | 6e637061 | 636b6167 |
| 1702260 | 65626f64 | 792c7061 | 636b6167 | 65626f64 | 79292e0a | 70617265 | 6e745f6f | 66286675 | 6e637072 | 6f636564 | 7572652c | 70726f63 |
| 1702340 | 65647572 | 65292e0a | 70617265 | 6e745f6f | 66286675 | 6e636675 | 6e637469 | 6f6e2c66 | 756e6374 | 696f6e29 | 2e0a7061 | 72656e74 |
| 1702420 | 5f6f6628 | 70726f63 | 65647572 | 65617263 | 68697465 | 63747572 | 652c6172 | 63686974 | 65637475 | 7265292e | 0a706172 | 656e745f |
| 1702500 | 6f662870 | 726f6365 | 64757265 | 70726f63 | 6573732c | 70726f63 | 65737329 | 2e0a7061 | 72656e74 | 5f6f6628 | 70726f63 | 65647572 |
| 1702560 | 65706163 | 6b616765 | 6465636c | 2c706163 | 6b616765 | 6465636c | 292e0a70 | 6172656e | 745f6f66 | 2870726f | 63656475 | 72657061 |
| 1702640 | 636b6167 | 65626f64 | 792c7061 | 636b6167 | 65626f64 | 79292e0a | 70617265 | 6e745f6f | 66287072 | 6f636564 | 75726566 | 756e6374 |
| 1702720 | 696f6e2c | 66756e63 | 74696f6e | 292e0a70 | 6172656e | 745f6f66 | 2870726f | 63656475 | 72657072 | 6f636564 | 7572652c | 70726f63 |

| | | | | | | | | | | | | |
|---|---|---|---|---|---|---|---|---|---|---|---|---|
| 1703000 | 65647572 | 65292e0a | 0a616e63 | 6573746f | 725f6f66 | 28432c41 | 29203a2d | 20706172 | 656e745f | 6f662841 | 2c41292e | 0a616e63 |
| 1703060 | 6573746f | 725f6f66 | 28432c41 | 29203a2d | 20706172 | 656e745f | 6f662843 | 2c50292c | 20212c20 | 616e6365 | 73746f72 | 5f6f6628 |
| 1703140 | 502c4129 | 2e0a0a0a | 69735f64 | 6566696e | 65642850 | 2c4d6f64 | 756c6529 | 203a2d20 | 616e616c | 797a696e | 675f756e | 69745f6e |
| 1703220 | 756d2855 | 6e292c20 | 64656669 | 6e697469 | 6f6e5f69 | 6e28556e | 2c502c4d | 6f64756c | 65292e0a | 69735f64 | 6566696e | 65642850 |
| 1703300 | 2c5f2920 | 3a2d2061 | 6e616c79 | 7a696e67 | 5f756e69 | 745f6e75 | 6d28556e | 31292c20 | 76697369 | 626c655f | 756e6974 | 7328556e |
| 1703360 | 312c556e | 32292c20 | 0a090909 | 28646573 | 69676e5f | 756e6974 | 28556e32 | 2c706163 | 6b616765 | 6465636c | 2c5f2c5f | 2c506163 |
| 1703440 | 6b616765 | 293b2064 | 65736967 | 6e5f756e | 69742855 | 6e322c70 | 61636b61 | 6765626f | 64792c5f | 2c5f2c50 | 61636b61 | 67652929 |
| 1703520 | 2c200a09 | 09095061 | 636b6167 | 653a502e | 0a69735f | 64656669 | 6e656428 | 502c5f29 | 203a2d20 | 616e616c | 797a696e | 675f756e |
| 1703600 | 69745f6e | 756d2855 | 6e292c20 | 6765745f | 7072696d | 5f756e69 | 7428556e | 2c556e31 | 2c50756d | 6f64756c | 65292c20 | 212c200a |
| 1703660 | 09090928 | 50756d6f | 64756c65 | 3a503b20 | 76697369 | 626c655f | 756e6974 | 7328556e | 312c556e | 32292c20 | 28646573 | 69676e5f |
| 1703740 | 756e6974 | 28556e32 | 2c706163 | 6b616765 | 6465636c | 2c5f2c5f | 2c506163 | 6b616765 | 293b0a09 | 09096465 | 7369676e | 5f756e69 |
| 1704020 | 7428556e | 322c7061 | 636b6167 | 65626f64 | 792c5f2c | 5f2c5061 | 636b6167 | 6529292c | 20506163 | 6b616765 | 3a50292e | 0a0a6465 |
| 1704100 | 66696e69 | 74696f6e | 5f696e28 | 5f2c502c | 4368696c | 6429203a | 2d204368 | 696c643a | 502e0a64 | 6566696e | 6974696f | 6e5f696e |
| 1704160 | 28556e2c | 502c4368 | 696c6429 | 203a2d20 | 70617265 | 6e742855 | 6e2c4368 | 696c642c | 50617265 | 6e74292c | 20212c20 | 69735f64 |
| 1704240 | 6566696e | 65642850 | 2c506172 | 656e7429 | 2e200a0a | 6765745f | 7072696d | 5f756e69 | 7428556e | 2c556e31 | 2c4d2920 | 3a2d2028 |
| 1704320 | 64657369 | 676e5f75 | 6e697428 | 556e2c61 | 72636869 | 74656374 | 7572652c | 492c5f2c | 416d2920 | 2d3e2041 | 6d3a656e | 74697479 |
| 1704400 | 2845292c | 20646573 | 69676e5f | 756e6974 | 28556e31 | 2c656e74 | 6974792c | 452c5f2c | 4d29293b | 0a090909 | 64657369 | 676e5f75 |
| 1704460 | 6e697428 | 556e2c70 | 61636b61 | 6765626f | 64792c49 | 2c5f2c5f | 292c2064 | 65736967 | 6e5f756e | 69742855 | 6e312c70 | 61636b61 |
| 1704540 | 67656465 | 636c2c49 | 2c5f2c4d | 292e0a09 | 09090a0a | 66756e63 | 74696f6e | 5f646566 | 696e6564 | 28502c49 | 29203a2d | 20616e61 |
| 1704620 | 6c797a69 | 6e675f75 | 6e69745f | 6e756d28 | 556e292c | 20636f6e | 6361745f | 6e616d65 | 73285b66 | 756e632c | 505d2c27 | 272c4670 |
| 1704700 | 292c0a09 | 09090964 | 65736967 | 6e5f756e | 69742855 | 6e2c4670 | 2c492c5f | 2c5f292e | 0a66756e | 6374696f | 6e5f6465 | 66696e65 |
| 1704760 | 6428502c | 4929203a | 20207061 | 72656e74 | 5f6f6628 | 502c5070 | 292c2066 | 756e6374 | 696f6e5f | 64656669 | 6e656428 | 50702c49 |
| 1705040 | 292e200a | 66756e63 | 74696f6e | 5f646566 | 696e6564 | 295f2c49 | 29203a2d | 20616e61 | 6c797a69 | 6e675f75 | 6e69745f | 6e756d28 |
| 1705120 | 556e292c | 20766973 | 69626c65 | 5f756e69 | 74732855 | 6e2c556e | 31292c0a | 09090909 | 64657369 | 676e5f75 | 6e697428 | 556e312c |
| 1705200 | 66756e63 | 7061636b | 61676562 | 6f64792c | 492c5f2c | 5f292e0a | 0a666f72 | 6d616c5f | 61637475 | 616c5f6d | 61746368 | 28502c49 |
| 1705260 | 2c417661 | 6c29203a | 2d20616e | 616c797a | 696e675f | 756e6974 | 5f6e756d | 28556e29 | 2c20636f | 6e636174 | 5f6e616d | 6573285b |
| 1705340 | 66756e63 | 2c505d2c | 27272c46 | 70292c0a | 09090909 | 64657369 | 676e5f75 | 6e697428 | 556e2c46 | 702c492c | 5f2c4d29 | 2c204d3a |
| 1705420 | 666f726d | 616c5f70 | 6172616d | 73284676 | 616c2c5f | 292c0a09 | 0909096d | 61746368 | 5f616374 | 75616c5f | 666f726d | 616c2846 |
| 1705500 | 76616c2c | 4176616c | 292e0a66 | 6f726d61 | 6c5f6163 | 7475616c | 5f6d6174 | 63682850 | 2c492c41 | 76616c29 | 203a2d20 | 70617265 |
| 1705560 | 6e745f6f | 6628502c | 5070292c | 20666f72 | 6d616c5f | 61637475 | 616c5f6d | 61746368 | 2850702c | 492c4176 | 616c292e | 0a666f72 |
| 1705640 | 6d616c5f | 61637475 | 616c5f6d | 61746368 | 285f2c49 | 2c417661 | 6c29203a | 2d20616e | 616c797a | 696e675f | 756e6974 | 5f6e756d |
| 1705720 | 28556e29 | 2c207669 | 7369626c | 655f756e | 69747328 | 556e2c55 | 6e31292c | 0a090909 | 09646573 | 69676e5f | 756e6974 | 28556e31 |
| 1706000 | 2c66756e | 63706163 | 6b616765 | 2c492c5f | 2c4d292c | 204d3a66 | 6f726d61 | 6c5f7061 | 72616d73 | 28467661 | 6c2c5f29 | 2c0a0909 |
| 1706060 | 09096d61 | 7463685f | 61637475 | 616c5f66 | 6f726d61 | 6c284676 | 616c2c41 | 76616c29 | 2e200a69 | 735f6465 | 66696e65 | 64312850 |
| 1706140 | 2c4d6f64 | 756c6529 | 203a2d20 | 64657369 | 676e5f75 | 6e697428 | 556e2c5f | 2c5f2c5f | 2c4d6f64 | 756c6529 | 2c206465 | 66696e69 |
| 1706220 | 74696f6e | 5f696e31 | 28556e2c | 502c4d6f | 64756c65 | 292e0a69 | 735f6465 | 66696e65 | 64312850 | 2c4d6f64 | 756c6529 | 203a2d20 |
| 1706300 | 64657369 | 676e5f75 | 6e697428 | 556e312c | 5f2c5f2c | 5f2c4d6f | 64756c65 | 292c2076 | 69736962 | 6c655f75 | 6e697473 | 28556e31 |
| 1706360 | 2c556e32 | 292c200a | 09090928 | 64657369 | 676e5f75 | 6e697428 | 556e322c | 7061636b | 61676564 | 65636c2c | 5f2c5f2c | 5061636b |
| 1706440 | 61676529 | 3b206465 | 7369676e | 5f756e69 | 7428556e | 322c7061 | 636b6167 | 65626f64 | 792c5f2c | 5f2c5061 | 636b6167 | 6529292c |
| 1706520 | 200a0909 | 09506163 | 6b616765 | 3a502e0a | 69735f64 | 6566696e | 65643128 | 502c4d6f | 64756c65 | 29203a2d | 20646573 | 69676e5f |
| 1706600 | 756e6974 | 28556e2c | 5f2c5f2c | 5f2c4d6f | 64756c65 | 292c2067 | 65745f70 | 72696d5f | 756e6974 | 28556e2c | 556e312c | 50756d6f |
| 1706660 | 64756c65 | 292c2021 | 2c200a09 | 09092850 | 756d6f64 | 756c653a | 503b2076 | 69736962 | 6c655f75 | 6e697473 | 28556e31 | 2c556e32 |
| 1706740 | 292c2028 | 64657369 | 676e5f75 | 6e697428 | 556e322c | 7061636b | 61676564 | 65636c2c | 5f2c5f2c | 5061636b | 61676529 | 3b0a0909 |
| 1707020 | 09646573 | 69676e5f | 756e6974 | 28556e32 | 2c706163 | 6b616765 | 626f6479 | 2c5f2c5f | 2c506163 | 6b616765 | 29292c20 | 5061636b |
| 1707100 | 6167653a | 50292e0a | 0a646566 | 696e6974 | 696f6e5f | 696e3128 | 5f2c502c | 4368696c | 6429203a | 2d204368 | 696c643a | 502e0a64 |
| 1707160 | 6566696e | 6974696f | 6e5f696e | 3128556e | 2c502c43 | 68696c64 | 29203a2d | 20706172 | 656e7428 | 556e2c43 | 68696c64 | 2c506172 |
| 1707240 | 656e7429 | 2c20212c | 2069735f | 64656669 | 6e656431 | 28502c50 | 6172656e | 74292e20 | 0a0a6973 | 5f636f6d | 706f6e65 | 6e742849 |
| 1707320 | 2c4c2920 | 3a2d2061 | 6e616c79 | 7a696e67 | 5f756e69 | 745f6e75 | 6d28556e | 292c2021 | 2c200a09 | 09092864 | 65736967 | 6e5f756e |
| 1707400 | 69742855 | 6e2c636f | 6d706f6e | 656e742c | 492c5f2c | 5f293b20 | 76697369 | 626c655f | 756e6974 | 7328556e | 2c556e31 | 292c0a09 |
| 1707460 | 09090909 | 64657369 | 676e5f75 | 6e697428 | 556e312c | 636f6d70 | 6f6e656e | 742c492c | 5f2c5f29 | 293b0a09 | 09097772 | 69746528 |
| 1707540 | 27436f6d | 706f6e65 | 6e742027 | 292c2077 | 72697465 | 2849292c | 20777269 | 74652827 | 206f6e20 | 6c696e65 | 2027292c | 20777269 |
| 1707620 | 7465284c | 292c0a09 | 09097772 | 69746528 | 27206e6f | 74206465 | 66696e65 | 64206561 | 726c6965 | 72202729 | 2c206e6c | 2e0ac53d |
| 1707700 | 000ec516 | 0100088f | 000000c7 | 000ec53d | 000ec516 | 000eb4a9 | 000ec546 | 000eb495 | 000ec54e | 000eb495 | 000ec54e | 000eb495 |
| 1707760 | 000ec54e | 000eb461 | 000ec566 | 000eb44d | 000ec56e | 000eb439 | 000ec576 | 000eb421 | 000ec57e | 000eb421 | 000ec57e | 000eb421 |
| 1710040 | 000ec57e | 000ec5a5 | 000ec57e | 0200088f | 000000a7 | 000eb419 | 000ec5a5 | 000ec57e | 000eb3d1 | 000ec5b2 | 000eb3bd | 000ec5ba |

```
1710120 000eb3a5 000ec5c2 000eb3a5 000ec5c2 000eb3a5 000ec5c2 000eb369 000ec5da 000eb355 000ec5e2 000eb334 000ec5ea
1710200 000eb33d 000ec5ea 000eb33d 000ec5ea 000ec611 000ec5ea 0200088f 000000a7 000eb335 000ec611 000ec5ea 000eb2ed
1710260 000ec61e 000eb2d5 000ec626 000eb2d5 000ec626 000eb2d5 000ec626 000eb299 000ec63e 000ec655 000ec63e 0300088f
1710340 0000007f 000eb291 000eb2a5 000ec655 000ec63e 000eb26d 000ec666 000eb26d 000ec666 000eb26d 000ec666 000eb231
1710420 000ec67e 000eb21d 000ec686 000eb205 000ec68e 000eb205 000ec68e 000eb205 000ec68e 000ec6b5 000ec68e 0200088f
1710500 000000a7 000eb1fd 000ec6b5 000ec68e 000eb1b5 000ec6c2 000eb19d 000ec6ca 000eb19d 000ec6ca 000eb19d 000ec6ca
1710560 000eb161 000ec6e2 000ec6f9 000ec6e2 0100088f 0000007f 000eb159 000eb16d 000ec6f9 000ec6e2 000eb135 000ec70a
1710640 000eb135 000ec70a 000eb135 000ec70a 000eb0f9 000ec722 000eb0e1 000ec72a 000eb0e1 000ec72a 000eb0e1 000ec72a
1710720 000ec751 000ec72a 0200088f 000000a7 000eb0d9 000ec751 000ec72a 000eb091 000ec75e 000eb079 000ec766 000eb079
1711000 000ec766 000eb079 000ec766 000eb03d 000ec77e 000ec795 000ec77e 0300088f 0000007f 000eb035 000eb049 000ec795
1711060 000ec77e 000eb011 000ec7a6 000eb011 000ec7a6 000eb011 000ec7a6 000eafd5 000ec7be 000eafc1 000ec7c6 000eafa9
1711140 000ec7ce 000eafa9 000ec7ce 000eafa9 000ec7ce 000ec7f5 000ec7ce 0200088f 000000a7 000eafa1 000ec7f5 000ec7ce
1711220 000eaf59 000ec802 000eaf41 000ec80a 000eaf41 000ec80a 000eaf41 000ec80a 000eaf05 000ec822 000ec839 000ec822
1711300 0300088f 0000007f 000eaef1 000eaf11 000ec839 000ec822 000eaed9 000ec84a 000eaed9 000ec84a 000eaed9 000ec84a
1711360 000eae9d 000ec862 000eae85 000ec86a 000eae85 000ec86a 000eae85 000ec86a 000ec891 000ec86a 0200088f 000000a7
1711440 000eae7d 000ec891 000ec86a 000eae35 000ec89e 000eae1d 000ec8a6 000eae1d 000ec8a6 000eae1d 000ec8a6 000eade1
1711520 000ec8be 000ec8d5 000ec8be 0300088f 0000007f 000eadd9 000eaded 000ec8d5 000ec8be 000eadb5 000ec8e6 000eadb5
1711600 000ec8e6 000eadb5 000ec8e6 000ead79 000ec8fe 000ec915 000ec8fe 0300088f 0000007f 000ead71 000ead85 000ec915
1711660 000ec8fe 000ead51 000ec926 000ec93d 000ec926 0300088f 0000007f 000ead49 000ead5d 000ec93d 000ec926 000ead29
1711740 000ec94e 000ead11 000ec956 000ead11 000ec956 000ead11 000ec956 000ec97d 000ec956 0200088f 000000a7 000ead09
1712020 000ec97d 000ec956 000eacc1 000ec98a 000eaca9 000ec992 000eaca9 000ec992 000eaca9 000ec992 000eac6d 000ec9aa
1712100 000ec9c1 000ec9aa 0300088f 0000007f 000eac65 000eac79 000ec9c1 000ec9aa 000eac41 000ec9d2 000eac41 000ec9d2
1712160 000eac41 000ec9d2 000eac05 000ec9ea 000eca01 000ec9ea 0300088f 0000007f 000eabfd 000eac11 000eca01 000ec9ea
1712240 000eabdd 000eca12 000eabdd 000eca12 000eabdd 000eca12 000eabb5 000eca2a 000eaba1 000eca32 000eab8d 000eca3a
1712320 000eab8d 000eca3a 000eab8d 000eca3a 000eca61 000eca3a 0100088f 000000c7 000eca61 000eca3a 000eab45 000eca6a
1712400 000eab31 000eca72 000eab31 000eca72 000eab31 000eca72 000eca99 000eca72 0100088f 000000c7 000eca99 000eca72
1712460 000eaae9 000ecaa2 000eaad5 000ecaaa 000eaad5 000ecaaa 000eaad5 000ecaaa 000ecad1 000ecaaa 0100088f 000000c7
1712540 000ecad1 000ecaaa 000eaa8d 000eca1a 000eaa79 000ecae2 000eaa79 000ecae2 000eaa79 000ecae2 000ecb09 000ecae2
1712620 0100088f 000000c7 000ecb09 000ecae2 000eaa31 000ecb12 000eaa1d 000ecb1a 000eaa1d 000ecb1a 000eaa1d 000ecb1a
1712700 000ecb41 000ecb1a 0100088f 000000c7 000ecb41 000ecb1a 000ea9d5 000ecb4a 000ea9c1 000ecb52 000ea9c1 000ecb52
1712760 000ea9c1 000ecb52 000ea984 000ecb6a 000ecb81 000ecb6a 0300088f 0000007f 000ea985 000ea999 000ecb81 000ecb6a
1713040 000ea965 000ecb92 000ea941 000ecb9a 000ea94d 000ecbb2 000ea965 000ecbba 000ecb81 000ecbc2 000ea9c1 000ecbca
1713120 000ea9d5 000ecbd2 000ecb41 000ecbda 000ecbe1 000ecb12 0200088f 000006af 000eaa3d 0200088f 00000ea3 000ea945
1713200 000ecbed 000ecc0e 0200088f 00001173 000ea971 000ecc01 000ecc1e 0100088f 00001a23 000ecc15 000ecc2e 0100088f
1713260 00000ef3 000ecc25 000ecc3e 0100088f 00000f93 000ecc35 000ecc4e 0100088f 00001c03 000ecc45 000ecc62 0200088f
1713340 00001683 000eaa3d 000ecc55 000ecc72 0100088f 00001c03 000ecc69 000ecc86 0200088f 00001023 000eaa99 000ecc79
1713420 000ecc96 0100088f 00001c03 000ecc8d 000eccaa 0200088f 00001023 000eaaf5 000ecc9d 000eccba 0100088f 00001c03
1713500 000eccb1 000eccca 0100088f 00001013 000eccc1 000eccda 0100088f 00001c03 000eccd1 000eccea 0100088f 00000fe3
1713560 000ecce1 000eccfa 0100088f 00001183 000eccf1 000ecd0a 0100088f 00000f23 000ecd01 000ecd1e 0200088f 00001b23
1713640 000eac11 000ecd11 000ecd32 0200088f 00000ed3 000eac39 000ecd25 000ecd46 0200088f 00001b23 000eac79 000ecd39
1713720 000ecd5a 0200088f 00000e13 000eaca1 000ecd4d 000ecd6e 0200088f 00000fd3 000eaccd 000ecd61 000ecd82 0200088f
1714000 00001bf3 000ead09 000ecd75 000ecd96 0200088f 00000fd3 000ead35 000ecd89 000ecdae 0300088f 00001b73 000ead49
1714060 000ead5d 000ecd9d 000ecdc2 0200088f 00001b63 000ead71 000ecdb5 000ecdda 0300088f 00000ee3 000eadc5 000eadad
1714140 000ecdc9 000ecdf2 0300088f 00001b73 000eadd9 000eaded 000ecde1 000ece0a 0300088f 00000ee3 000eae2d 000eae15
1714220 000ecdf9 000ece1a 0100088f 00001033 000ece11 000ece2e 0200088f 00001bf3 000eae7d 000ece21 000ece42 0200088f
1714300 00001073 000eaea9 000ece35 000ece5a 0300088f 00000ee3 000eaee9 000eaed1 000ece49 000ece72 0300088f 00001b73
1714360 000eaefd 000eaf11 000ece61 000ece8a 0300088f 00000ee3 000eaf51 000eaf39 000ece79 000ece9e 0200088f 000010c3
1714440 000eaf65 000ece91 000eceb2 0200088f 00001bf3 000eafa1 000ecea5 000ecec6 0200088f 00001073 000eafcd 000eceb9
1714520 000eceda 0200088f 00001073 000eafe1 000ececd 000ecef2 0300088f 00000ee3 000eb021 000eb009 000ecee1 000ecf0a
1714600 0300088f 00001b73 000eb035 000eb049 000ecef9 000ecf22 0300088f 00000ee3 000eb089 000eb071 000ecf11 000ecf36
1714660 0200088f 000010c3 000eb091 000ecf29 000ecf4a 0200088f 00001bf3 000eb0d9 000ecf3d 000ecf5e 0200088f 00001073
1714740 000eb105 000ecf51 000ecf76 0300088f 00000ee3 000eb145 000eb12d 000ecf65 000ecf8e 0300088f 00001b73 000eb159
1715020 000eb16d 000ecf7d 000ecfa6 0300088f 00000ee3 000eb1ad 000eb195 000ecf95 000ecfb6 0100088f-000010b3 000ecfad
1715100 000ecfca 0200088f 00001bf3 000eb1fd 000ecfbd 000ecfde 0200088f 00001073 000eb229 000ecfd1 000ecff2 0200088f
1715160 00001073 000eb23d 000ecfe5 000ed00a 0300088f 00000ee3 000eb27d 000eb265 000ecff9 000ed022 0300088f 00001b73
```

| | | | | | | | | | | | | |
|---|---|---|---|---|---|---|---|---|---|---|---|---|
| 1715240 | 000eb291 | 000eb2a5 | 000ed011 | 000ed03a | 0300088f | 00000ee3 | 000eb2e5 | 000eb2cd | 000ed029 | 000ed04a | 0100088f | 00001083 |
| 1715320 | 000ed041 | 000ed05e | 0200088f | 00001bf3 | 000eb335 | 000ed051 | 000ed072 | 0200088f | 00001073 | 000eb361 | 000ed065 | 000ed082 |
| 1715400 | 0100088f | 00001063 | 000ed079 | 000ed09a | 0300088f | 00000ee3 | 000eb3b5 | 000eb39d | 000ed089 | 000ed0ae | 0200088f | 00001073 |
| 1715460 | 000eb3c9 | 000ed0a1 | 000ed0c2 | 0200088f | 00001023 | 000eb3dd | 000ed0b5 | 000ed0d6 | 0200088f | 00001bf3 | 000eb419 | 000ed0c9 |
| 1715540 | 000ed0ea | 0200088f | 00001073 | 000eb445 | 000ed0dd | 000ed0fe | 0200088f | 00000fd3 | 000eb459 | 000ed0f1 | 000ed10e | 0100088f |
| 1715620 | 00001063 | 000ed105 | 000ed122 | 0200088f | 00000f33 | 000eb4a1 | 000ed115 | 000ed136 | 0200088f | 00001173 | 000eb4b5 | 000ed129 |
| 1715700 | 000ed146 | 0100088f | 00001c03 | 000ed13d | 000ed15a | 0200088f | 00001073 | 000eb511 | 000ed14d | 000ed16a | 0100088f | 00001c03 |
| 1715760 | 000ed161 | 000ed17e | 0200088f | 00001073 | 000eb56d | 000ed171 | 000ed18e | 0100088f | 00001183 | 000ed185 | 000ed1a2 | 0200088f |
| 1716040 | 00000f33 | 000eb5a9 | 000ed195 | 000ed1ba | 0300088f | 00001b73 | 000eb5bd | 000eb5d1 | 000ed1a9 | 000ed1d2 | 0300088f | 00000ee3 |
| 1716120 | 000eb611 | 000eb5f9 | 000ed1c1 | 000ed1ea | 0300088f | 00001b73 | 000eb625 | 000eb639 | 000ed1d9 | 000ed202 | 0300088f | 00000ee3 |
| 1716200 | 000eb679 | 000eb661 | 000ed1f1 | 000ed216 | 0200088f | 00001073 | 000eb68d | 000ed209 | 000ed22a | 0200088f | 00001bf3 | 000eb6c9 |
| 1716260 | 000ed21d | 000ed23e | 0200088f | 00001073 | 000eb6f5 | 000ed231 | 000ed252 | 0200088f | 00001073 | 000eb709 | 000ed245 | 000ed266 |
| 1716340 | 0200088f | 00001073 | 000eb71d | 000ed259 | 000ed27a | 0200088f | 00001073 | 000eb731 | 000ed26d | 000ed28a | 0100088f | 00001063 |
| 1716420 | 000ed281 | 000ed2a2 | 0100088f | 00000ee3 | 000eb785 | 000eb76d | 000ed291 | 000ed2ba | 0300088f | 00001b73 | 000eb799 | 000eb7ad |
| 1716500 | 000ed2a9 | 000ed2d2 | 0300088f | 00000ee3 | 000eb7ed | 000eb7d5 | 000ed2c1 | 000ed2e2 | 0100088f | 00001033 | 000ed2d9 | 000ed2f6 |
| 1716560 | 0200088f | 00001bf3 | 000eb83d | 000ed2e9 | 000ed30a | 0200088f | 00001073 | 000eb869 | 000ed2fd | 000ed322 | 0300088f | 00000ee3 |
| 1716640 | 000eb8a9 | 000eb891 | 000ed311 | 000ed33a | 0300088f | 00001b73 | 000eb8bd | 000eb8d1 | 000ed329 | 000ed352 | 0300088f | 00000ee3 |
| 1716720 | 000eb911 | 000eb8f9 | 000ed341 | 000ed366 | 0200088f | 000010c3 | 000eb925 | 000ed359 | 000ed37a | 0200088f | 00001bf3 | 000eb961 |
| 1717000 | 000ed36d | 000ed38e | 0200088f | 00001073 | 000eb98d | 000ed381 | 000ed3a2 | 0200088f | 00001073 | 000eb9a1 | 000ed395 | 000ed3ba |
| 1717060 | 0300088f | 00000ee3 | 000eb9e1 | 2cac0028 | 0002438a | 2ca0b66c | 00000000 | 00000000 | 000e92d8 | 000e92d8 | 000e92e2 | 000eb3a8 |
| 1717140 | 27f0001c | 000e9348 | 4e1c0000 | 00000007 | 35ec359c | 239c0000 | 0007fccc | 2cac10c3 | 0002438a | 2ca0d3f1 | 00000000 | 00000001 |
| 1717220 | 000ed3d8 | 000e9348 | 000e9352 | 000ed418 | 000ed3e4 | 000b8b2c | 020047c7 | 00002c07 | 00000008 | 000ed43c | 000ed43c | 0001005c |
| 1717300 | 00000000 | 2cacd42d | 0002438a | 2ca0088f | 00000000 | 00000001 | 000eb390 | 000ed460 | 000ed46a | 000eb3a4 | 29540018 | 0002438a |
| 1717360 | 56f862c0 | 57586bf4 | 675022bc | 000ed42c | 000b8b80 | 030047cf | 00002c07 | 0000000c | 000e8de0 | 000ed4b0 | 0001005c | 00000000 |
| 1717440 | 2c780018 | 0002438a | 56f86420 | 57586c34 | 675022bc | 000ed498 | 2954d4a5 | 0002438a | 2ca0088f | 00000000 | 00000000 | 000ed498 |
| 1717520 | 000ed498 | 000ed4a2 | 000ed4d4 | 00000000 | 00106765 | 74737562 | 6c697374 | 5f756e74 | 696c00e1 | 000b8ba0 | 030047d7 | 00002c07 |
| 1717600 | 0000000c | 000ed524 | 000ed524 | 0001005c | 00000000 | 27f00018 | 000ed54c | 56f8671c | 5fa05758 | 6b745370 | 54f8228c | 2cacd532 |
| 1717660 | 0002438a | 2ca00b23 | 00000000 | 00000000 | 000ed50c | 000ed54c | 000e90ac | 000ed548 | 00000000 | 29540028 | 0002438a | 56f86580 |
| 1717740 | 00185758 | 67b85370 | 57b86c84 | 00186784 | 45506c38 | 537022bc | 000ed4fc | 000b8db8 | 03004817 | 00002c07 | 0000000c | 000ed80c |
| 1720020 | 000ed81c | 0001005c | 00000000 | 000b8c7c | 030047ef | 00002c07 | 0000000c | 000e9648 | 000e9648 | 0001005c | 00000000 | 000b8c9c |
| 1720100 | 020047f7 | 00002c07 | 00000008 | 000ed5ec | 000ed5ec | 0001005c | 00000000 | 27f00018 | 000ed614 | 4e1c0000 | 000034c7 | 52c40000 |
| 1720160 | 000033bf | 2cacbe35 | 0002438a | 2ca09135 | 0000003c | 0000000d | 000ed5d4 | 000ed75c | 0002438a | 000e96bc | 000f47e4 | 28c40018 |
| 1720240 | 000ed62c | 4e1c0000 | 00003b7f | 52c40000 | 000033bf | 28c40018 | 000ed644 | 4e1c0000 | 00003b87 | 52c40000 | 000034c7 | 28c40018 |
| 1720320 | 000ed65c | 4e1c0000 | 00003b8f | 52c40000 | 00003eb7 | 28c40018 | 000ed694 | 4e1c0000 | 00003b97 | 52c40000 | 00003f2f | 000d7fd0 |
| 1720400 | 0200480f | 00002c07 | 00000008 | 000da6bc | 000ed774 | 0001005c | 00000000 | 28c40018 | 000ed6ac | 4e1c0000 | 000047ff | 52c40000 |
| 1720460 | 000034bf | 28c40018 | 000ed6c4 | 4e1c0000 | 00003b9f | 52c40000 | 0000344f | 28c40018 | 000ed6dc | 4e1c0000 | 00003baf | 52c40000 |
| 1720540 | 000033bf | 28c40018 | 000ed70c | 4e1c0000 | 00003bb7 | 52c40000 | 000034c7 | 00147072 | 6f636564 | 75726570 | 61636b61 | 67656465 |
| 1720620 | 636c0000 | 28c40018 | 000ed724 | 4e1c0000 | 00004807 | 52c40000 | 00003eb7 | 28c40018 | 000ed73c | 4e1c0000 | 00003bcf | 52c40000 |
| 1720700 | 00003f2f | 28c40018 | 000ed75c | 4e1c0000 | 00003bc7 | 52c40000 | 0000344f | 000ed748 | 000dafcc | 29540018 | 0002438a | 4e1c0000 |
| 1720760 | 00003bbf | 52c40000 | 000034bf | 29540024 | 0002438a | 252046ec | 3310247c | 000ed5c4 | 00142ecc | 37f03cf4 | 242c0000 | 000ed684 |
| 1721040 | 000b6661 | 74616c5f | 6572726f | 72000000 | 27f00024 | 000e97ac | 45c44700 | 3280247c | 000c652c | 0018386c | 37f03cf4 | 242c0000 |
| 1721120 | 000ed584 | 000d6765 | 745f7072 | 696d5f75 | 6e697400 | 000b8fa4 | 0300481f | 00002c07 | 0000000c | 000e991c | 000e991c | 0001005c |
| 1721200 | 00000000 | 000048af | b3280000 | 000edb58 | 00000000 | 27f00010 | 000ed81c | 358822bc | 0007e68c | 29540024 | 0002438a | 252046d8 |
| 1721260 | 35ec33bc | 24d00000 | 000ed5a4 | 00142ecc | 33302340 | 000c8e2c | 000048af | b3280000 | 000edb84 | 00000000 | 00106675 | 6e637469 |
| 1721340 | 6f6e5f64 | 6566696e | 65640000 | 000b902c | 02004827 | 00002c07 | 00000008 | 000e99f0 | 000e9a3c | 0001005c | 00000000 | 0000487f |
| 1721420 | b328da74 | 000eb440 | 00000000 | 28c40020 | 000e9a3c | 252046ec | 3310247c | 000ed5c4 | 001437f0 | 3cf4234c | 000ed874 | 0013666f |
| 1721500 | 726d616c | 5f616374 | 75616c5f | 6d617463 | 69000000 | 00136d61 | 7463685f | 61637475 | 616c5f66 | 6f726d61 | 6c000000 | 000b9060 |
| 1721560 | 0300482f | 00002c07 | 0000000c | 000e9aac | 000e9b20 | 0001005c | 00000000 | 000c6375 | 7272656e | 745f7469 | 6d650000 | 000f411c |
| 1721640 | 000ed9e0 | 000e8dc0 | 000db20c | 000b90f8 | 02004837 | 00002c07 | 00000008 | 000939e0 | 000919e0 | 00000000 | 00000000 | 28c40028 |
| 1721720 | 000e9b20 | 252046ec | 47683310 | 24d00000 | 000ed5c4 | 0018386c | 37f03cf4 | 242c0000 | 000ed8f4 | 000b6675 | 6e637061 | 636b6167 |
| 1722000 | 65000000 | 000e6465 | 66696e69 | 74696f6e | 5f696e31 | 00000000 | 000a696e | 64657876 | 616c7565 | 00000000 | 000ed9c8 | 000b2d84 |
| 1722060 | 000b92c8 | 03004847 | 00002c07 | 0000000c | 000ed9e8 | 000ed9f8 | 0001005c | 00000000 | 0000487f | b3280000 | 000eb414 | 00000000 |
| 1722140 | 000ed884 | 000be1ac | 000f170c | 00000000 | 27f00010 | 000ed9f8 | 358822bc | 0007e68c | 29540024 | 0002438a | 252046d8 | 35ec33bc |
| 1722220 | 24d00000 | 000ed5a4 | 00142ecc | 3d302340 | 000c9974 | 000c6973 | 5f636f6d | 706f6e65 | 6e740000 | 000a436f | 6d706f6e | 656e7420 |
| 1722300 | 00000000 | 0015206e | 6f742064 | 6566696e | 65642065 | 61726c69 | 65722000 | ffffffff | 0200484f | 00002c07 | 00000008 | 000e9dec |

| | | | | | | | | | | | |
|---|---|---|---|---|---|---|---|---|---|---|---|
| 1722360 | 000e9dec | 0001005c | 00000000 | 000c6869 | 65726675 | 6e63732e | 706c0000 | 00000000 | 00000018 | 000edad8 | 7fffffff | 000e9234 |
| 1722440 | 00000000 | 2aa86c84 | 000e6c80 | 000ee22c | 2aa8daa0 | 000eda9c | 000ee1cc | 2aa8daac | 000edaa8 | 000ee16c | 2aa8dab8 | 000edab4 |
| 1722520 | 000ee10c | 00092069 | 6e206669 | 6c652000 | 00066572 | 726d7367 | 00000000 | 00087265 | 7365742e | 706c0000 | 00292f68 | 6f6d652f |
| 1722600 | 6f736173 | 312f612f | 73726565 | 2f73656d | 616e7469 | 635f6368 | 65636b31 | 2f657272 | 6d736700 | 002c2f68 | 6f6d652f | 6f736173 |
| 1722660 | 312f612f | 73726565 | 2f73656d | 616e7469 | 635f6368 | 65636b31 | 2f657272 | 6d73672e | 706c0028 | 0000002c | 0009ca5c | b27cb66c |
| 1722740 | 0000065e | 7fffffff | 000eb410 | 02000ce5 | 0200293d | 000048af | 000002f3 | 00002aff | 0000002c | 0009cb94 | b27cb66c | 00000669 |
| 1723020 | 7fffffff | 000eb43c | 02000ce5 | 02001f6d | 000048af | 00002c07 | 00002aff | 00000000 | 00000014 | 000f4cec | 7fffffff | 000f0910 |
| 1723100 | 00294661 | 74616c20 | 73796e74 | 61782065 | 72726f72 | 3a20696c | 6c656761 | 6c207379 | 6e746178 | 20616674 | 65722000 | 000erbec |
| 1723160 | 00000090 | b27cb66c | 00000660 | 00000668 | 0009cbc1 | 02000ce5 | 02002385 | 000048af | 00002c07 | 00002aff | 000edc4c | 00000038 |
| 1723240 | b27cb66c | 00000661 | 0000066a | 000eebf0 | 02000ce5 | 05001b04 | 000048b7 | 00000013 | 00002c07 | 0078d9a3 | 000002f3 | 00002aff |
| 1723320 | 000eebec | 0000002c | b4f0b4c4 | 00000660 | 7fffffff | 0007eaad | 00000000 | 00000000 | 000eed70 | 0002438a | 000ed610 | 27f00084 |
| 1723400 | 000f1b44 | 252046d9 | 332c32b8 | 24d00000 | 000e6a5c | 001842ac | 000048bf | 00080d0c | 0018408c | 00080d0c | 001442ac | 00003ad7 |
| 1723460 | 00080d0c | 00144078 | 00080d0c | 001042ac | 000048c7 | 00080d0c | 001039a4 | 00080d0c | 000c43e4 | 020046ef | 5f8c43c0 | 02000cdf |
| 1723540 | 4b8c0000 | 00002c07 | 6bb4247c | 0008042c | 000c247c | 0007fd0c | 000c234c | 0007ea2c | 002a4661 | 74616c20 | 73796e74 | 61782065 |
| 1723620 | 72726f72 | 3a20756e | 65787065 | 63746564 | 20696465 | 6e746966 | 69657220 | 00000000 | 27f00060 | 000eddc4 | 5d100000 | 02003647 |
| 1723700 | 68546a00 | 46d842ac | 000048cf | 00080d0c | 00183a4c | 00080d0c | 001442ac | 00003ad7 | 00080d0c | 001439f8 | 00080d0c | 001042ac |
| 1723760 | 000048c7 | 00080d0c | 001039a4 | 00080d0c | 000c247c | 0007fd0c | 000c234c | 0007ea2c | 00384661 | 74616c20 | 73796e74 | 61782065 |
| 1724040 | 72726f72 | 3a20756e | 65787065 | 63746564 | 206c6566 | 74207061 | 72656e74 | 68657369 | 73206f6e | 206c696e | 65200000 | 28c4004c |
| 1724120 | 000ede4c | 5d100000 | 010036d7 | 684046d8 | 43000000 | 000048d7 | 00080d0c | 001439f8 | 00080d0c | 001042ac | 000048c7 | 00080d0c |
| 1724200 | 001039a4 | 00080d0c | 000c247c | 0007fd0c | 000c234c | 0007ea2c | 00394661 | 74616c20 | 73796e74 | 61782065 | 72726f72 | 3a20756e |
| 1724260 | 65787065 | 63746564 | 20726967 | 68742070 | 6172656e | 74686573 | 6973206f | 6e206c69 | 6e652000 | 28c4004c | 000edec4 | 5d100000 |
| 1724340 | 010036df | 684046d8 | 43000000 | 000048df | 00080d0c | 001439f8 | 00080d0c | 001042ac | 000048c7 | 00080d0c | 001039a4 | 00080d0c |
| 1724420 | 000c247c | 0007fd0c | 000c234c | 0007ea2c | 00264661 | 74616c20 | 73796e74 | 61782065 | 72726f72 | 3a20756e | 65787065 | 63746564 |
| 1724500 | 20737472 | 696e6720 | 00000000 | 28c40060 | 000edf58 | 5d100000 | 02003767 | 68546a00 | 46d842ac | 000048e7 | 00080d0c | 00183a4c |
| 1724560 | 00080d0c | 001442ac | 00003ad7 | 00080d0c | 001439f8 | 00080d0c | 001042ac | 000048c7 | 00080d0c | 001039a4 | 00080d0c | 000c247c |
| 1724640 | 0007fd0c | 000c234c | 0007ea2c | 00314661 | 74616c20 | 73796e74 | 61782065 | 72726f72 | 3a20756e | 65787065 | 63746564 | 2073656d |
| 1724720 | 69636f6c | 6f6e206f | 6e206c69 | 6e652000 | 28c4004c | 000edfd4 | 5d100000 | 010040b7 | 684046d8 | 43000000 | 000048ef | 00080d0c |
| 1725000 | 001439f8 | 00080d0c | 001042ac | 000048c7 | 00080d0c | 001039a4 | 00080d0c | 000c247c | 0007fd0c | 000c234c | 0007ea2c | 002d4661 |
| 1725060 | 74616c20 | 73796e74 | 61782065 | 72726f72 | 3a20756e | 65787065 | 63746564 | 20636f6c | 6f6e206f | 6e206c69 | 6e652000 | 28c4004c |
| 1725140 | 000ee050 | 5d100000 | 01003717 | 684046d8 | 43000000 | 000048f7 | 00080d0c | 001439f8 | 00080d0c | 001042ac | 000048c7 | 00080d0c |
| 1725220 | 001039a4 | 00080d0c | 000c247c | 0007fd0c | 000c234c | 0007ea2c | 002d4661 | 74616c20 | 73796e74 | 61782065 | 72726f72 | 3a20756e |
| 1725300 | 65787065 | 63746564 | 20636f6d | 6d61206f | 6e206c69 | 6e652000 | 28c4004c | 000ee09c | 5d100000 | 010036f7 | 684046d8 | 43000000 |
| 1725360 | 000048ff | 00080d0c | 001439f8 | 00080d0c | 001042ac | 000048c7 | 00080d0c | 001039a4 | 00080d0c | 000c247c | 0007fd0c | 000c234c |
| 1725440 | 0007ea2c | 28c40060 | 000ee0fc | 5d100000 | 03003697 | 4b8c0000 | 0000369f | 5fa06840 | 46d842ac | 00004907 | 00080d0c | 001442ac |
| 1725520 | 00003ad7 | 00080d0c | 001439f8 | 00080d0c | 001042ac | 000048c7 | 00080d0c | 001039a4 | 00080d0c | 000c247c | 0007fd0c | 000c234c |
| 1725600 | 0007ea2c | 28c40060 | 000ee15c | 5d100000 | 03003697 | 4b8c0000 | 000036a7 | 5fa06840 | 46d842ac | 0000490f | 00080d0c | 001442ac |
| 1725660 | 00003ad7 | 00080d0c | 001439f8 | 00080d0c | 001042ac | 000048c7 | 00080d0c | 001039a4 | 00080d0c | 000c247c | 0007fd0c | 000c234c |
| 1725740 | 0007ea2c | 28c40060 | 000ee1bc | 5d100000 | 03003697 | 4b8c0000 | 000036af | 5fa06840 | 46d842ac | 00004917 | 00080d0c | 001442ac |
| 1726020 | 00003ad7 | 00080d0c | 001439f8 | 00080d0c | 001042ac | 000048c7 | 00080d0c | 001039a4 | 00080d0c | 000c247c | 0007fd0c | 000c234c |
| 1726100 | 0007ea2c | 28c40060 | 000ee21c | 5d100000 | 03003697 | 4b8c0000 | 00003727 | 5fa06840 | 46d842ac | 0000491f | 00080d0c | 001442ac |
| 1726160 | 00003ad7 | 00080d0c | 001439f8 | 00080d0c | 001042ac | 000048c7 | 00080d0c | 001039a4 | 00080d0c | 000c247c | 0007fd0c | 000c234c |
| 1726240 | 0007ea2c | 28c40060 | 000ee27c | 5d100000 | 03003697 | 4b8c0000 | 0000372f | 5fa06840 | 46d842ac | 00004927 | 00080d0c | 001442ac |
| 1726320 | 00003ad7 | 00080d0c | 001439f8 | 00080d0c | 001042ac | 000048c7 | 00080d0c | 001039a4 | 00080d0c | 000c247c | 0007fd0c | 000c234c |
| 1726400 | 0007ea2c | 28c40060 | 000ee2dc | 5d100000 | 03003697 | 4b8c0000 | 00003737 | 5fa06840 | 46d842ac | 0000492f | 00080d0c | 001442ac |
| 1726460 | 00003ad7 | 00080d0c | 001439f8 | 00080d0c | 001042ac | 000048c7 | 00080d0c | 001039a4 | 00080d0c | 000c247c | 0007fd0c | 000c234c |
| 1726540 | 0007ea2c | 28c40064 | 000ee380 | 5d100000 | 03003377 | 68545fa0 | 6a0046d8 | 43000000 | 00004937 | 00080d0c | 00183a4c | 00080d0c |
| 1726620 | 001442ac | 00003ad7 | 00080d0c | 001439f8 | 00080d0c | 001042ac | 000048c7 | 00080d0c | 001039a4 | 00080d0c | 000c247c | 0007fd0c |
| 1726700 | 000c234c | 0007ea2c | 00314661 | 74616c20 | 73796e74 | 61782065 | 72726f72 | 3a20756e | 65787065 | 63746564 | 20636861 | 72616374 |
| 1726760 | 6572206c | 69746572 | 616c2000 | 00076e61 | 74757261 | 6c00904c | 28c40060 | 000ee3e0 | 5d100000 | 030036bf | 4b8c0000 | 000036ef |
| 1727040 | 5fa06840 | 46d842ac | 0000493f | 00080d0c | 001442ac | 00003ad7 | 00080d0c | 001439f8 | 00080d0c | 001042ac | 000048c7 | 00080d0c |
| 1727120 | 001039a4 | 00080d0c | 000c247c | 0007fd0c | 000c234c | 0007ea2c | 29c40060 | 000ee440 | 5d100000 | 030036bf | 4b8c0000 | 000036ff |
| 1727200 | 5fa06840 | 46d842ac | 00004947 | 00080d0c | 001442ac | 00003ad7 | 00080d0c | 001439f8 | 00080d0c | 001042ac | 000048c7 | 00080d0c |
| 1727260 | 001039a4 | 00080d0c | 000c247c | 0007fd0c | 000c234c | 0007ea2c | 28c40060 | 000ee4a0 | 5d100000 | 030036bf | 4b8c0000 | 000036c7 |
| 1727340 | 5fa06840 | 46d842ac | 0000494f | 00080d0c | 001442ac | 00003ad7 | 00080d0c | 001439f8 | 00080d0c | 001042ac | 000048c7 | 00080d0c |
| 1727420 | 001039a4 | 00080d0c | 000c247c | 0007fd0c | 000c234c | 0007ea2c | 28c40060 | 000ee500 | 5d100000 | 03003387 | 4b8c0000 | 000036e7 |

| | | | | | | | | | | | | |
|---|---|---|---|---|---|---|---|---|---|---|---|---|
| 1727500 | 5fa06840 | 46d842ac | 00004957 | 00080d0c | 001442ac | 00003ad7 | 00080d0c | 001439f8 | 00080d0c | 001042ac | 000048c7 | 00080d0c |
| 1727560 | 001039a4 | 00080d0c | 000c247c | 0007fd0c | 000c234c | 0007ea2c | 28c40060 | 000ee560 | 5d100000 | 03003387 | 4b8c0000 | 0000246f |
| 1727640 | 5fa06840 | 46d842ac | 0000495f | 00080d0c | 001442ac | 00003ad7 | 00080d0c | 001439f8 | 00080d0c | 001042ac | 000048c7 | 00080d0c |
| 1727720 | 001039a4 | 00080d0c | 000c247c | 0007fd0c | 000c234c | 0007ea2c | 28c40060 | 000ee5c0 | 5d100000 | 03003387 | 4b8c0000 | 0000370f |
| 1730000 | 5fa06840 | 46d842ac | 00004967 | 00080d0c | 001442ac | 00003ad7 | 00080d0c | 001439f8 | 00080d0c | 001042ac | 000048c7 | 00080d0c |
| 1730060 | 001039a4 | 00080d0c | 000c247c | 0007fd0c | 000c234c | 0007ea2c | 28c40060 | 000ee620 | 5d100000 | 03003367 | 4b8c0000 | 00003687 |
| 1730140 | 5fa06840 | 46d842ac | 0000496f | 00080d0c | 001442ac | 00003ad7 | 00080d0c | 001439f8 | 00080d0c | 001042ac | 000048c7 | 00080d0c |
| 1730220 | 001039a4 | 00080d0c | 000c247c | 0007fd0c | 000c234c | 0007ea2c | 28c40060 | 000ee6b8 | 5d100000 | 03003367 | 4b8c0000 | 000025c7 |
| 1730300 | 5fa06840 | 46d842ac | 00004977 | 00080d0c | 001442ac | 00003ad7 | 00080d0c | 001439f8 | 00080d0c | 001042ac | 000048c7 | 00080d0c |
| 1730360 | 001039a4 | 00080d0c | 000c247c | 0007fd0c | 000c234c | 0007ea2c | 00324661 | 74616c20 | 73796e74 | 61782065 | 72726f72 | 3a20756e |
| 1730440 | 65787065 | 63746564 | 2061706f | 7374726f | 70686520 | 6f6e206c | 696e6520 | 00000000 | 28c4004c | 000ee734 | 5d100000 | 010036cf |
| 1730520 | 684046d8 | 43000000 | 0000497f | 00080d0c | 001439f8 | 00080d0c | 001042ac | 000048c7 | 00080d0c | 001039a4 | 00080d0c | 000c247c |
| 1730600 | 0007fd0c | 000c234c | 0007ea2c | 002d4661 | 74616c20 | 73796e74 | 61782065 | 72726f72 | 3a20756e | 65787065 | 63746564 | 20617272 |
| 1730660 | 6f77206f | 6e206c69 | 6e652000 | 28c4004c | 000ee7bc | 5d100000 | 0100367f | 684046d8 | 43000000 | 00004987 | 00080d0c | 001439f8 |
| 1730740 | 00080d0c | 001042ac | 000048c7 | 00080d0c | 001039a4 | 00080d0c | 000c247c | 0007fd0c | 000c234c | 0007ea2c | 00374661 | 74616c20 |
| 1731020 | 73796e74 | 61782065 | 72726f72 | 3a20756e | 65787065 | 63746564 | 20646563 | 696d616c | 206c6974 | 6572616c | 206f6e20 | 6c696e65 |
| 1731100 | 20000000 | 28c40050 | 000ee844 | 5d100000 | 0600374f | 5fb40014 | 684046d8 | 43000000 | 0000498f | 00080d0c | 001439f8 | 00080d0c |
| 1731160 | 001042ac | 000048c7 | 00080d0c | 001039a4 | 00080d0c | 000c247c | 0007fd0c | 000c234c | 0007ea2c | 00354661 | 74616c20 | 73796e74 |
| 1731240 | 61782065 | 72726f72 | 3a20756e | 65787065 | 63746564 | 20626173 | 6564206c | 69746572 | 616c206f | 6e206c69 | 6e652000 | 28c40050 |
| 1731320 | 000ee8cc | 5d100000 | 07003747 | 5fb40018 | 684046d8 | 43000000 | 00004997 | 00080d0c | 001439f8 | 00080d0c | 001042ac | 000048c7 |
| 1731400 | 00080d0c | 001039a4 | 00080d0c | 000c247c | 0007fd0c | 000c234c | 0007ea2c | 00324661 | 74616c20 | 73796e74 | 61782065 | 72726f72 |
| 1731460 | 3a20756e | 65787065 | 63746564 | 20626974 | 20737472 | 696e6720 | 6f6e206c | 696e6520 | 00000000 | 28c4004c | 000ee998 | 5d100000 |
| 1731540 | 0100380f | 5f8c6840 | 46d842ac | 0000499f | 00080d0c | 001439f8 | 00080d0c | 001042ac | 000048c7 | 00080d0c | 001039a4 | 00080d0c |
| 1731620 | 000c247c | 0007fd0c | 000c234c | 0007ea2c | 000eeab0 | 000ee848 | 000edfe0 | 00000000 | 00000000 | 00000000 | 00000000 | 000eeb2c |
| 1731700 | 000f1df5 | 000ee7c8 | 000ee934 | 00000000 | 000ed91d | 00000000 | 000ee2e8 | 000ee740 | 000e8da0 | 000eea34 | 000e8d60 | 00000000 |
| 1731760 | 00000000 | 00000000 | 000da121 | 000e8d80 | 00000000 | 000ee6c4 | 000eddd0 | 000ede58 | 00000000 | 00000000 | 000ee05c | 00000000 |
| 1732040 | 28c40060 | 000eea28 | 5d100000 | 02003757 | 63546a00 | 46d842ac | 000049a7 | 00080d0c | 00183a4c | 00080d0c | 001442ac | 00003ad7 |
| 1732120 | 00080d0c | 001439f8 | 00080d0c | 001042ac | 000048c7 | 00080d0c | 001039a4 | 00080d0c | 000c247c | 0007fd0c | 000c234c | 0007ea2c |
| 1732200 | 002c4661 | 74616c20 | 73796e74 | 61782065 | 72726f72 | 3a20756e | 65787065 | 63746564 | 20223a3d | 22206f6e | 206c696e | 65200000 |
| 1732260 | 28c4004c | 000eeaa4 | 5d100000 | 0100368f | 684046d8 | 43000000 | 000049af | 00080d0c | 001439f8 | 00080d0c | 001042ac | 000048c7 |
| 1732340 | 00080d0c | 001039a4 | 00080d0c | 000c247c | 0007fd0c | 000c234c | 0007ea2c | 002b4661 | 74616c20 | 73796e74 | 61782065 | 72726f72 |
| 1732420 | 3a20756e | 65787065 | 63746564 | 20222e22 | 206f6e20 | 6c696e65 | 20000000 | 28c4004c | 000eeb20 | 5d100000 | 01003707 | 684046d8 |
| 1732500 | 43000000 | 000049b7 | 00080d0c | 001439f8 | 00080d0c | 001042ac | 000048c7 | 00080d0c | 001039a4 | 00080d0c | 000c247c | 0007fd0c |
| 1732560 | 000c234c | 0007ea2c | 002b4661 | 74616c20 | 73796e74 | 61782065 | 72726f72 | 3a20756e | 65787065 | 63746564 | 20227c22 | 206f6e20 |
| 1732640 | 6c696e65 | 20000000 | 28c4004c | 000eeb9c | 5d100000 | 0100373f | 684046d8 | 43000000 | 000049bf | 00080d0c | 001439f8 | 00080d0c |
| 1732720 | 001042ac | 000048c7 | 00080d0c | 001039a4 | 00080d0c | 000c247c | 0007fd0c | 000c234c | 0007ea2c | 002c4661 | 74616c20 | 73796e74 |
| 1733000 | 61782065 | 72726f72 | 3a20756e | 65787065 | 63746564 | 20223c3e | 22206f6e | 206c696e | 65200000 | 2954004c | 0002438a | 5d100000 |
| 1733060 | 010036b7 | 684046d8 | 43000000 | 000049c7 | 00080d0c | 001439f8 | 00080d0c | 001042ac | 000048c7 | 00080d0c | 001039a4 | 00080d0c |
| 1733140 | 000c247c | 0007fd0c | 000c234c | 0007ea2c | 000eec84 | 00000038 | b27cb66c | 00000662 | 0000066b | 000eec88 | 02000ce5 | 05001b0d |
| 1733220 | 00003f37 | 00000013 | 00002c07 | 0078f123 | 000002f3 | 00002aff | 2c780060 | 0002438a | 45b846ec | 2e7ca1ec | 2ba00018 | 004839a4 |
| 1733300 | 000b4d6c | 0018aa50 | 2e9842ac | 000049cf | 00080d0c | 001439f8 | 00080d0c | 001042ac | 000049d7 | 00080d0c | 001039a4 | 00080d0c |
| 1733360 | 000c42ac | 000049df | 00080d0c | 000c234c | 0007fd0c | 2c58c5a8 | 000eed34 | 00000070 | b27cb66c | 00000663 | 0000066c | 000eecc0 |
| 1733440 | 02000ce5 | 05001b0d | 000041b7 | 00000003 | 00002c07 | 00694303 | 000002f3 | 00002aff | 000eed34 | 00000038 | b27cb66c | 00000664 |
| 1733520 | 0000066d | 000eed38 | 02000ce5 | 05001b0d | 000049e7 | 0000000b | 00002c07 | 0078f363 | 000002f3 | 00002aff | 2c780040 | 0002438a |
| 1733600 | 45b82e7c | ada82ba0 | 00140012 | 3b4c0000 | 000c65d4 | 0014aa34 | 2e9822a0 | 2c5842ac | 000049ef | 00080d0c | 001039a4 | 00080d0c |
| 1733660 | 000c234c | 0007fd0c | 000efac4 | 00000070 | b27cb66c | 00000665 | 0000066e | 000eed70 | 02000ce5 | 05001b0d | 000041bf | 00000003 |
| 1733740 | 00002c07 | 00694403 | 000002f3 | 00002aff | 000efac4 | 00000038 | b130b66c | 00000666 | 0000066f | 000edc51 | 02000ce5 | 05001b0d |
| 1734020 | 000049f7 | 0000000b | 00002c07 | 0078fa63 | 000002f3 | 00002aff | 2c780040 | 0002438a | 45b82e7c | ada82ba0 | 00140012 | 3b4c0000 |
| 1734100 | 000f1f98 | 0014aa34 | 2e9822a0 | 2c5842ac | 000049ff | 00080d0c | 001039a4 | 00080d0c | 000c234c | 0007fd0c | 000004a8 | 000f16e4 |
| 1734160 | b27cb66c | 00000746 | 7fffffff | 000ef290 | 02000ce5 | 02003ac5 | 0000001b | 0200352d | 0000433f | 00000001 | 0100433d | 00003e57 |
| 1734240 | 00000001 | 0100433d | 0000083f | 00000001 | 0100433d | 0000084f | 00000001 | 0100433d | 00000887 | 00000001 | 0100433d | 0000088f |
| 1734320 | 00000001 | 0100433d | 00000977 | 00000001 | 0100433d | 00004a57 | 00000001 | 0100433d | 0000097f | 00000001 | 0100433d | 0000098f |
| 1734400 | 00000001 | 0100433d | 000009ff | 00000001 | 0100433d | 00000a07 | 00000001 | 0100433d | 00000a37 | 00000001 | 0100433d | 00000a3f |
| 1734460 | 00000001 | 0100433d | 00000a57 | 00000001 | 0100433d | 0000000f | 00000001 | 0100433d | 00000abf | 00000001 | 0100433d | 00000003 |
| 1734540 | 00000001 | 0100433d | 0000000b | 00000001 | 0100433d | 00000013 | 00000001 | 0100433d | 0000001b | 00000001 | 0100433d | 00000023 |

| | | | | | | | | | | | | |
|---|---|---|---|---|---|---|---|---|---|---|---|---|
| 1734620 | 00000001 | 0100433d | 0000002b | 00000001 | 0100433d | 00000033 | 00000001 | 0100433d | 0000003b | 00000001 | 0100433d | 00000043 |
| 1734700 | 00000001 | 0100433d | 0000004b | 00000001 | 0100433d | 00000cdf | 00000001 | 0100433d | 00000d0f | 00000001 | 0100433d | 00000d17 |
| 1734760 | 00000001 | 0100433d | 00000d27 | 00000001 | 0100433d | 00000d57 | 00000001 | 0100433d | 00000d6f | 00000001 | 0100433d | 00004a5f |
| 1735040 | 00000001 | 0100433d | 00004a67 | 00000001 | 0100433d | 00004a6f | 00000001 | 0100433d | 00000da7 | 00000001 | 0100433d | 00004a77 |
| 1735120 | 00000001 | 0100433d | 00004a7f | 00000001 | 0100433d | 00004a87 | 00000001 | 0100433d | 00004a8f | 00000001 | 0100433d | 00004a97 |
| 1735200 | 00000001 | 0100433d | 00004a9f | 00000001 | 0100433d | 00004aa7 | 00000001 | 0100433d | 00004aaf | 00000001 | 0100433d | 00004ab7 |
| 1735260 | 00000001 | 0100433d | 00004abf | 00000001 | 0100433d | 00004ac7 | 00000001 | 0100433d | 00004acf | 00000001 | 0100433d | 00004ad7 |
| 1735340 | 00000001 | 0100433d | 00001037 | 00000001 | 0100433d | 00004adf | 00000001 | 0100433d | 00004ae7 | 00000001 | 0100433d | 00004aef |
| 1735420 | 00000001 | 0100433d | 00004af7 | 00000001 | 0100433d | 00004aff | 00000001 | 0100433d | 00004b07 | 00000001 | 0100433d | 00004b0f |
| 1735500 | 00000001 | 0100433d | 00004b17 | 00000001 | 0100433d | 00004b1f | 00000001 | 0100433d | 0000153f | 00000001 | 0100433d | 0000163f |
| 1735560 | 00000001 | 0100433d | 0000165f | 00000001 | 0100433d | 0000166f | 00000001 | 0100433d | 00003637 | 00000001 | 0100433d | 00004b27 |
| 1735640 | 00000001 | 0100433d | 00001aa7 | 00000001 | 0100433d | 00003c2f | 00000001 | 0100433d | 00001c5f | 00000001 | 0100433d | 00001dff |
| 1735720 | 00000001 | 0100433d | 00003c37 | 00000001 | 0100433d | 00001f0f | 00000001 | 0100433d | 00004b2f | 00000001 | 0100433d | 00004b37 |
| 1736000 | 00000001 | 0100433d | 00002147 | 00000001 | 0100433d | 00004b3f | 00000001 | 0100433d | 00004b47 | 00000001 | 0100433d | 00004b4f |
| 1736060 | 00000001 | 0100433d | 000023bf | 00000001 | 0100433d | 00004b57 | 00000001 | 0100433d | 00004b5f | 00000001 | 0100433d | 00004b67 |
| 1736140 | 00000001 | 0100433d | 00004b6f | 00000001 | 0100433d | 00002797 | 00000001 | 0100433d | 00004b77 | 00000001 | 0100433d | 00004b7f |
| 1736220 | 00000001 | 0100433d | 00004b87 | 00000001 | 0100433d | 00002c4f | 00000001 | 0100433d | 00004b8f | 00000001 | 0100433d | 00004b97 |
| 1736300 | 00000001 | 0100433d | 00004b9f | 00000001 | 0100433d | 00002d57 | 00000001 | 0100433d | 00002d5f | 00000001 | 0100433d | 00002d6f |
| 1736360 | 00000001 | 0100433d | 00002d97 | 00000001 | 0100433d | 00004ba7 | 00000007 | 00002aff | 00000030 | 000eede8 | b27cb66c | 00000747 |
| 1736440 | 7fffffff | 000ef2c0 | 02000ce5 | 02003ac5 | 0000005b | 01004515 | 00004baf | 00002aff | 00000044 | 000ef290 | b27cb66c | 00000748 |
| 1736520 | 7fffffff | 000ef304 | 02000ce5 | 02003ac5 | 0000005b | 0200352d | 00004baf | 00000001 | 00001f4f | 00000001 | 00002aff | 00000007 |
| 1736600 | 00002aff | 00000030 | 000ef2c0 | b27cb66c | 00000749 | 7fffffff | 000ef334 | 02000ce5 | 02003ac5 | 00000063 | 01004515 | 00004bb7 |
| 1736660 | 00002aff | 0000004c | 000ef304 | b27cb66c | 0000074a | 7fffffff | 000ef380 | 02000ce5 | 02003ac5 | 00000063 | 0200352d | 00004bb7 |
| 1736740 | 00000001 | 0100433d | 00000003 | 00000001 | 0100433d | 0000000b | 00000007 | 00002aff | 00000030 | 000ef334 | b27cb66c | 0000074b |
| 1737020 | 7fffffff | 000ef3b0 | 02000ce5 | 02003ac5 | 0000006b | 01004515 | 000021ef | 00002aff | 00000040 | 000ef380 | b27cb66c | 0000074c |
| 1737100 | 7fffffff | 000ef3f0 | 02000ce5 | 02003ac5 | 0000006b | 0200352d | 000021ef | 010034cd | 0200351d | e1bf8007 | a1c00007 | 00002aff |
| 1737160 | 0000005c | 000ef3b0 | b27cb66c | 0000074d | 7fffffff | 000ef44c | 02000ce5 | 02003ac5 | 00000073 | 0200350d | 00004bbf | 02003c55 |
| 1737240 | 02003c5d | 000021ef | 010034cd | 0200351d | e1bf8007 | a1c00007 | 010034cd | 0200351d | 80000007 | a1c00007 | 00002aff | 0000005c |
| 1737320 | 000ef3f0 | b27cb66c | 0000074e | 7fffffff | 000ef4a8 | 02000ce5 | 02003ac5 | 0000007b | 0200350d | 00004bc7 | 02003c55 | 02003c5d |
| 1737400 | 000021ef | 010034cd | 0200351d | e1bf8007 | a1c00007 | 010034cd | 0200351d | 9fc00007 | a1c00007 | 00002aff | 00000030 | 000ef44c |
| 1737460 | b27cb66c | 0000074f | 7fffffff | 000ef4d8 | 02000ce5 | 02003ac5 | 00000093 | 01004525 | 00004bcf | 00002aff | 0000009c | 000ef4a8 |
| 1737540 | b27cb66c | 00000750 | 7fffffff | 000ef574 | 02000ce5 | 02003ac5 | 00000093 | 0200352d | 00004bcf | 020045ad | 00000001 | 02003c5d |
| 1737620 | 00004bbf | 02003c55 | 02003c5d | 000021ef | 010034cd | 0200351d | e1bf8007 | a1c00007 | 010034cd | 0200351d | 80000007 | a1c00007 |
| 1737700 | 00000007 | 02003c55 | 02003c5d | 00004bb7 | 00000001 | 0100433d | 00000003 | 00000001 | 0100433d | 0000000b | 00000007 | 00000007 |
| 1737760 | 00002aff | 00000030 | 000ef4d8 | b27cb66c | 00000751 | 7fffffff | 000ef5a4 | 02000ce5 | 02003ac5 | 0000008b | 01004525 | 000029e7 |
| 1740040 | 00002aff | 000004f8 | 000ef574 | b27cb66c | 00000752 | 7fffffff | 000f04f9 | 02000ce5 | 02003ac5 | 0000008b | 0200352d | 000029e7 |
| 1740120 | 020045ad | 00000001 | 02003c5d | 00004bc7 | 02003c55 | 02003c5d | 000021ef | 010034cd | 0200351d | e1bf8007 | a1c00007 | 010034cd |
| 1740200 | 0200351d | 9fc00007 | a1c00007 | 00000007 | 02003c55 | 02003c5d | 0000433f | 00000001 | 0100433d | 00003e57 | 00000001 | 0100433d |
| 1740260 | 0000083f | 00000001 | 0100433d | 0000084f | 00000001 | 0100433d | 00000887 | 00000001 | 0100433d | 0000088f | 00000001 | 0100433d |
| 1740340 | 00000977 | 00000001 | 0100433d | 00004a57 | 00000001 | 0100433d | 0000097f | 00000001 | 0100433d | 0000098f | 00000001 | 0100433d |
| 1740420 | 000009ff | 00000001 | 0100433d | 00000a07 | 00000001 | 0100433d | 00000a37 | 00000001 | 0100433d | 00000a3f | 00000001 | 0100433d |
| 1740500 | 00000a57 | 00000001 | 0100433d | 0000000f | 00000001 | 0100433d | 00000abf | 00000001 | 0100433d | 00000003 | 00000001 | 0100433d |
| 1740560 | 0000000b | 00000001 | 0100433d | 00000013 | 00000001 | 0100433d | 0000001b | 00000001 | 0100433d | 00000023 | 00000001 | 0100433d |
| 1740640 | 0000002b | 00000001 | 0100433d | 00000033 | 00000001 | 0100433d | 0000003b | 00000001 | 0100433d | 00000043 | 00000001 | 0100433d |
| 1740720 | 0000004b | 00000001 | 0100433d | 00000cdf | 00000001 | 0100433d | 00000d0f | 00000001 | 0100433d | 00000d17 | 00000001 | 0100433d |
| 1741000 | 00000d27 | 00000001 | 0100433d | 00000d57 | 00000001 | 0100433d | 00000d6f | 00000001 | 0100433d | 00004a5f | 00000001 | 0100433d |
| 1741060 | 00004a67 | 00000001 | 0100433d | 00004a6f | 00000001 | 0100433d | 00000da7 | 00000001 | 0100433d | 00004a77 | 00000001 | 0100433d |
| 1741140 | 00004a7f | 00000001 | 0100433d | 00004a87 | 00000001 | 0100433d | 00004a8f | 00000001 | 0100433d | 00004a97 | 00000001 | 0100433d |
| 1741220 | 00004a9f | 00000001 | 0100433d | 00004aa7 | 00000001 | 0100433d | 00004aaf | 00000001 | 0100433d | 00004ab7 | 00000001 | 0100433d |
| 1741300 | 00004abf | 00000001 | 0100433d | 00004ac7 | 00000001 | 0100433d | 00004acf | 00000001 | 0100433d | 00004ad7 | 00000001 | 0100433d |
| 1741360 | 00001037 | 00000001 | 0100433d | 00004adf | 00000001 | 0100433d | 00004ae7 | 00000001 | 0100433d | 00004aef | 00000001 | 0100433d |
| 1741440 | 00004af7 | 00000001 | 0100433d | 00004aff | 00000001 | 0100433d | 00004b07 | 00000001 | 0100433d | 00004b0f | 00000001 | 0100433d |
| 1741520 | 00004b17 | 00000001 | 0100433d | 00004b1f | 00000001 | 0100433d | 0000153f | 00000001 | 0100433d | 0000163f | 00000001 | 0100433d |
| 1741600 | 0000165f | 00000001 | 0100433d | 0000166f | 00000001 | 0100433d | 00003637 | 00000001 | 0100433d | 00004b27 | 00000001 | 0100433d |
| 1741660 | 00001aa7 | 00000001 | 0100433d | 00003c2f | 00000001 | 0100433d | 00001c5f | 00000001 | 0100433d | 00001dff | 00000001 | 0100433d |

```
1741740  00003c37 00000001 0100433d 00001f0f 00000001 0100433d 00004b2f 00000001 0100433d 00004b37 00000001 0100433d
1742020  00002147 00000001 0100433d 00004b3f 00000001 0100433d 00004b47 00000001 0100433d 00004b4f 00000001 0100433d
1742100  000023bf 00000001 0100433d 00004b57 00000001 0100433d 00004b5f 00000001 0100433d 00004b67 00000001 0100433d
1742160  00004b6f 00000001 0100433d 00002797 00000001 0100433d 00004b77 00000001 0100433d 00004b7f 00000001 0100433d
1742240  00004b87 00000001 0100433d 00002c4f 00000001 0100433d 00004b8f 00000001 0100433d 00004b97 00000001 0100433d
1742320  00004b9f 00000001 0100433d 00002d57 00000001 0100433d 00002d5f 00000001 0100433d 00002d6f 00000001 0100433d
1742400  00002d97 00000001 0100433d 00004ba7 00000007 00000007 00002aff 0000002c 000efa9c b4f0b4e4 00000755 7fffffff
1742460  000c6665 00000000 00000001 000f4db0 0002438a 000f4dd0 000efb20 00000038 00000000 00000000 00000000 00000000
1742540  00000000 00000000 00000000 00000000 00000000 00000000 00000000 00000000 000404bc 0000486f 00002c07 00000000
1742620  000eb504 000eb504 0001005d 00000000 000f48ec 000efd84 00000090 b288b66c 00000670 7fffffff 000f1fb0 02000ce5
1742700  0100147d 01002d65 0000000b 00002aff 000efb84 00000038 b27cb66c 00000671 0000075a 000efd88 02000ce5 05001b0d
1742760  00004a0f 0000000b 00002c07 0078fca3 000001db 00002aff 000efd84 0000002c b4f0b4e4 00000670 7fffffff 0007eaad
1743040  00000000 00000000 000efd88 0002438a 000eda98 00000134 000efbb4 b0f8b66c 00000672 7fffffff 000f1fd5 02000ce5
1743120  01004a0d 0000000c 02000a3d 02000935 00679f03 03004065 00000001 0000000e 00000001 00004a17 00000007 0000000f
1743200  00000010 02000a3d 02000935 00403b63 02002995 0000283f 00000014 02000a3d 02000935 00622463 02003a0d 00000012
1743260  00000001 00000018 0000001c 02000a3d 02000935 00403b63 02002995 0000283f 00000001 00000020 00000001 00000024
1743340  00000007 02000a3d 02000935 003fa463 02002015 00004a1f 00000001 00000026 00000007 02000a3d 0000083f 02000a3d
1743420  02000935 00403b63 02002995 0000283f 00000028 02000a3d 02000935 00401f63 01002815 02000cdd 00002c07 01003a55
1743500  0000002c 02000a3d 02000935 003f5c63 01001b75 02000cdd 00002c07 01003a55 00000012 02000d0d 02000a3d 02000935
1743560  00694003 030041a5 00000030 00000001 0000001a 0000001e 00000007 02000a3d 02000935 00403b63 02002995 0000283f
1743640  00000001 00000034 00000001 00000038 00000007 02000a3d 02000935 003fa463 02002015 00004a27 00000001 0000003a
1743720  00000007 02000935 00402163 01002825 02000cdd 00002c07 020046ed 0000003c 00000040 02000935 0078d9a3 020048b5
1744000  0000001a 00000012 000f054c 00000038 b130b66c 00000673 0000075b 000efb89 02000ce5 05001b0d 00004a17 0000000b
1744060  00002c07 007900a3 000001db 00002aff 000002c0 000efdc0 b0f8b66c 00000674 7fffffff 000f2015 02000ce5 01004a15
1744140  0000000c 02000a3d 02000935 00679f03 03004065 00000001 0000000e 00000001 00004a17 00000007 0000000f 00000010
1744220  02000a3d 02000935 00403b63 02002995 0000283f 00000014 02000a3d 02000935 00622463 02003a0d 00000012 00000001
1744300  00000018 0000001c 02000a3d 02000935 00403b63 02002995 0000283f 00000001 00000020 00000001 00000024 00000007
1744360  02000a3d 02000935 003fa463 02002015 00004a1f 00000001 00000026 00000007 02000a3d 0000083f 02000a3d 02000935
1744440  00403b63 02002995 0000283f 00000028 02000a3d 02000935 00401f63 01002815 02000cdd 00002c07 01003a55 0000002c
1744520  02000a3d 02000935 003f5c63 01001b75 02000cdd 00002c07 01003a55 00000012 02000a3d 02000d0d 02000a3d 02000935
1744600  00694003 030041a5 00000030 00000001 0000001a 0000001e 00000007 02000a3d 02000935 00403b63 02002995 0000283f
1744660  00000001 00000034 00000001 00000038 00000007 02000a3d 02000935 003fa463 02002015 00004a27 00000001 0000003a
1744740  00000007 02000935 00402163 01002825 02000cdd 00002c07 020046ed 0000003c 00000040 02000935 0078d9a3 020048b5
1745020  0000001a 00000012 02000a3d 02000935 00403b63 02002995 0000283f 00000044 02000a3d 02000935 00585ce3 02000885
1745100  00000032 00003ebf 02000a3d 02000935 00632963 01003a3d 00000048 02000a3d 02000935 00401f63 01002815 02000cdd
1745160  00002c07 01003a5d 0000004c 02000a3d 0100294d 0200226d 00000050 02000a55 01000895 0000004a 0000000b 02000a3d
1745240  02000935 003f5c63 01001b75 02000cdd 00002c07 01003a5d 00000052 02000a3d 02000935 00403b63 02002995 0000283f
1745320  00000001 00000054 00000001 00000058 00000007 02000935 003fa463 02002015 00004a2f 00000001 0000005a 00000007
1745400  00000000 80000410 820d0000 000210d3 2f686f6d 652f6f73 6173312f 612f7372 65652f73 656d616e 7469635f 63686563
1745460  6b310000 00000000 00000000 00000000 00000000 00000000 00000000 00000000 00000000 00000000 00000000 00000000
1745540  00000000 00000000 00000000 00000000 00000000 00000000 00000000 00000000 00000000 00000000 00000000 00000000
*
1747360  00000000 00000000 00000000 00000000 00000000 00000000 00000000 00000000 00302f68 6f6d652f 6f736173 312f612f
1747440  73726565 2f736564 616e7469 635f6368 65636b31 2f737464 7061636b 672e7668 646c0020 0000002c 000f04c4 b4f0b4e4
1747520  00000743 7fffffff 000f4d51 00000000 00000001 000c6544 0002438a 000c44d4 000a163c 00000008 0000002c 000f16b8
1747600  b288b4e4 00000744 7fffffff 000f48b5 0000001c 00000008 000f16e4 0002438a 000f4d60 0000002c 000f0524 b4f0b4e4
1747660  00000677 7fffffff 000c661d 00000000 00000001 000f40f8 0002438a 000f4118 000f0980 00000408 b27cb66c 0000067c
1747740  00000740 000f04c4 02000ce5 020046ed 00004a4f 0000000b 00002aff 000f05a4 0000002c b27cb66c 0000067d 0000073f
1750020  000f0550 02000ce5 020046ed 0000226f 0000000b 00002aff 000f05d0 0000002c b27cb66c 0000067e 0000073e 000f057c
1750100  02000ce5 020046ed 0000352f 0000001b 00002aff 000f05fc 0000002c b27cb66c 0000067f 0000073d 000f05a8 02000ce5
1750160  020046ed 0000433f 0000001b 00002aff 000f0628 0000002c b27cb66c 00000680 0000073c 000f05d4 02000ce5 020046ed
1750240  0000226f 0000001b 00002aff 000f0654 0000002c b27cb66c 00000681 0000073b 000f0600 02000ce5 020046ed 000046ff
1750320  0000001b 00002aff 000f0680 0000002c b27cb66c 00000682 0000073a 000f062c 02000ce5 020046ed 00004727 00000023
1750400  00002aff 000f06ac 0000002c b27cb66c 00000683 00000739 000f0658 02000ce5 020046ed 000036f7 00000023 00002aff
1750460  000f06d8 0000002c b27cb66c 00000684 00000738 000f0684 02000ce5 020046ed 00004727 0000002b 00002aff 000f0704
```

| | | | | | | | | | | | | |
|---|---|---|---|---|---|---|---|---|---|---|---|---|
| 1750540 | 0000002c | b27cb66c | 00000685 | 00000737 | 000f06b0 | 02000ce5 | 020046ed | 000036f7 | 0000002b | 00002aff | 000f0730 | 0000002c |
| 1750620 | b27cb66c | 00000686 | 00000736 | 000f06dc | 02000ce5 | 020046ed | 00004727 | 00000033 | 00002aff | 000f075c | 0000002c | b27cb66c |
| 1750700 | 00000687 | 00000735 | 000f0708 | 02000ce5 | 020046ed | 000036f7 | 00000033 | 00002aff | 000f0788 | 0000002c | b27cb66c | 00000688 |
| 1750760 | 00000734 | 000f0734 | 02000ce5 | 020046ed | 00004727 | 0000003b | 00002aff | 000f07b4 | 0000002c | b27cb66c | 00000689 | 00000733 |
| 1751040 | 000f0760 | 02000ce5 | 020046ed | 000036f7 | 0000003b | 00002aff | 000f07e0 | 0000002c | b27cb66c | 0000068a | 00000732 | 000f078c |
| 1751120 | 02000ce5 | 020046ed | 00004727 | 00000043 | 00002aff | 000f080c | 0000002c | b27cb66c | 0000068b | 00000731 | 000f07b8 | 02000ce5 |
| 1751200 | 020046ed | 000036f7 | 00000043 | 00002aff | 000f0838 | 0000002c | b27cb66c | 0000068c | 00000730 | 000f07e4 | 02000ce5 | 020046ed |
| 1751260 | 00004727 | 0000004b | 00002aff | 000f0864 | 0000002c | b27cb66c | 0000068d | 0000072f | 000f0810 | 02000ce5 | 020046ed | 000036f7 |
| 1751340 | 0000004b | 00002aff | 000f0890 | 0000002c | b27cb66c | 0000068e | 0000072e | 000f083c | 02000ce5 | 020046ed | 00004727 | 00000053 |
| 1751420 | 00002aff | 000f08bc | 0000002c | b27cb66c | 0000068f | 0000072d | 000f0868 | 02000ce5 | 020046ed | 000036f7 | 00000053 | 00002aff |
| 1751500 | 000f08e8 | 0000002c | b27cb66c | 00000690 | 0000072c | 000f0894 | 02000ce5 | 020046ed | 00004707 | 00000053 | 00002aff | 000f0914 |
| 1751560 | 0000002c | b27cb66c | 000006ab | 00000714 | 000f0d20 | 02000ce5 | 020046ed | 0000470f | 0000006b | 00002aff | 000f0928 | 00000014 |
| 1751640 | 000f47b0 | 7fffffff | 00000000 | 000f0980 | 0000002c | b27cb66c | 00000691 | 0000072b | 000f08c0 | 02000ce5 | 020046ed | 0000371f |
| 1751720 | 00000053 | 00002aff | 0000002c | 000f0958 | b4f0b4e4 | 00000691 | 7fffffff | 000c65d5 | 0000003c | 00000009 | 000c65a4 | 0002438a |
| 1752000 | 000f1580 | 000f1720 | 00000c04 | b27cb66c | 00000693 | 0000072a | 000f092c | 02000ce5 | 020046ed | 0000352f | 0000005b | 00002aff |
| 1752060 | 000f09d8 | 0000002c | b27cb66c | 00000694 | 00000729 | 000f0984 | 02000ce5 | 020046ed | 00004baf | 0000005b | 00002aff | 000f0a04 |
| 1752140 | 0000002c | b27cb66c | 00000695 | 00000728 | 000f09b0 | 02000ce5 | 020046ed | 0000226f | 0000005b | 00002aff | 000f0a30 | 0000002c |
| 1752220 | b27cb66c | 00000696 | 00000727 | 000f09dc | 02000ce5 | 020046ed | 000046ff | 0000005b | 00002aff | 000f0a5c | 0000002c | b27cb66c |
| 1752300 | 00000697 | 00000726 | 000f0a08 | 02000ce5 | 020046ed | 00001f4f | 0000005b | 00002aff | 000f0a88 | 0000002c | b27cb66c | 00000698 |
| 1752360 | 00000725 | 000f0a34 | 02000ce5 | 020046ed | 000036f7 | 0000005b | 00002aff | 000f0ab4 | 0000002c | b27cb66c | 00000699 | 00000724 |
| 1752440 | 000f0a60 | 02000ce5 | 020046ed | 00002aff | 0000005b | 00002aff | 000f0ae0 | 0000002c | b27cb66c | 0000069a | 00000723 | 000f0a8c |
| 1752520 | 02000ce5 | 020046ed | 00004707 | 0000005b | 00002aff | 000f0b0c | 0000002c | b27cb66c | 0000069b | 00000722 | 000f0ab8 | 02000ce5 |
| 1752600 | 020046ed | 0000371f | 0000005b | 00002aff | 000f0b38 | 0000002c | b27cb66c | 0000069d | 00000721 | 000f0ae4 | 02000ce5 | 020046ed |
| 1752660 | 0000352f | 00000063 | 00002aff | 000f0b64 | 0000002c | b27cb66c | 0000069e | 00000720 | 000f0b10 | 02000ce5 | 020046ed | 00004bb7 |
| 1752740 | 00000063 | 00002aff | 000f0b90 | 0000002c | b27cb66c | 0000069f | 0000071f | 000f0b3c | 02000ce5 | 020046ed | 0000226f | 00000063 |
| 1753020 | 00002aff | 000f0bbc | 0000002c | b27cb66c | 000006a0 | 0000071e | 000f0b68 | 02000ce5 | 020046ed | 000046ff | 00000063 | 00002aff |
| 1753100 | 000f0be8 | 0000002c | b27cb66c | 000006a1 | 0000071d | 000f0b94 | 02000ce5 | 020046ed | 00004727 | 00000063 | 00002aff | 000f0c14 |
| 1753160 | 0000002c | b27cb66c | 000006a2 | 0000071c | 000f0bc0 | 02000ce5 | 020046ed | 000036f7 | 00000063 | 00002aff | 000f0c40 | 0000002c |
| 1753240 | b27cb66c | 000006a3 | 0000071b | 000f0bec | 02000ce5 | 020046ed | 00004707 | 00000063 | 00002aff | 000f0c6c | 0000002c | b27cb66c |
| 1753320 | 000006a4 | 0000071a | 000f0c18 | 02000ce5 | 020046ed | 0000371f | 00000063 | 00002aff | 000f0c98 | 0000002c | b27cb66c | 000006a6 |
| 1753400 | 00000719 | 000f0c44 | 02000ce5 | 020046ed | 0000352f | 0000006b | 00002aff | 000f0cc4 | 0000002c | b27cb66c | 000006a7 | 00000718 |
| 1753460 | 000f0c70 | 02000ce5 | 020046ed | 000021ef | 0000006b | 00002aff | 000f0cf0 | 0000002c | b27cb66c | 000006a8 | 00000717 | 000f0c9c |
| 1753540 | 02000ce5 | 020046ed | 0000226f | 0000006b | 00002aff | 000f0d1c | 0000002c | b27cb66c | 000006a9 | 00000716 | 000f0cc8 | 02000ce5 |
| 1753620 | 020046ed | 000034cf | 0000006b | 00002aff | 000f0d48 | 0000002c | b27cb66c | 000006aa | 00000715 | 000f0cf4 | 02000ce5 | 020046ed |
| 1753700 | 000036ff | 0000006b | 00002aff | 000f0dc8 | 00000080 | 00000000 | 000f4240 | 000f418c | 000f414c | 00000000 | 000f415c | 00000000 |
| 1753760 | 000f04e9 | 00000000 | 00000000 | 00000000 | 000f412c | 00000000 | 00000000 | 00000000 | 00000000 | 00000000 | 00000000 | 00000000 |
| 1754040 | 000e900d | 000f4314 | 00000000 | 00000000 | 000f43bc | 00000000 | 00000000 | 00000000 | 000f4398 | 000f419c | 000f42c1 | 000f0df4 |
| 1754120 | 0000002c | b27cb66c | 000006ac | 00000713 | 000f0dec | 02000ce5 | 020046ed | 0000351f | 0000006b | 00002aff | 000f0e20 | 0000002c |
| 1754200 | b27cb66c | 000006ad | 00000712 | 000f0dcc | 02000ce5 | 020046ed | 0000371f | 0000006b | 00002aff | 000f0e4c | 0000002c | b27cb66c |
| 1754260 | 000006af | 00000711 | 000f0df8 | 02000ce5 | 020046ed | 0000350f | 00000073 | 00002aff | 000f0e78 | 0000002c | b27cb66c | 000006b0 |
| 1754340 | 00000710 | 000f0e24 | 02000ce5 | 020046ed | 00004bbf | 00000073 | 00002aff | 000f0ea4 | 0000002c | b27cb66c | 000006b1 | 0000070f |
| 1754420 | 000f0e50 | 02000ce5 | 020046ed | 0000226f | 00000073 | 00002aff | 000f0ed0 | 0000002c | b27cb66c | 000006b2 | 0000070e | 000f0e7c |
| 1754500 | 02000ce5 | 020046ed | 000021ef | 00000073 | 00002aff | 000f0efc | 0000002c | b27cb66c | 000006b3 | 0000070d | 000f0ea8 | 02000ce5 |
| 1754560 | 020046ed | 000034cf | 00000073 | 00002aff | 000f0f28 | 0000002c | b27cb66c | 000006b4 | 0000070c | 000f0ed4 | 02000ce5 | 020046ed |
| 1754640 | 0000470f | 00000073 | 00002aff | 000f0f54 | 0000002c | b27cb66c | 000006b5 | 0000070b | 000f0f00 | 02000ce5 | 020046ed | 0000351f |
| 1754720 | 00000073 | 00002aff | 000f0f80 | 0000002c | b27cb66c | 000006b6 | 0000070a | 000f0f2c | 02000ce5 | 020046ed | 0000371f | 00000073 |
| 1755000 | 00002aff | 000f0fac | 0000002c | b27cb66c | 000006b8 | 00000709 | 000f0f58 | 02000ce5 | 020046ed | 0000350f | 0000007b | 00002aff |
| 1755060 | 000f0fd8 | 0000002c | b27cb66c | 000006b9 | 00000708 | 000f0f84 | 02000ce5 | 020046ed | 00004bc7 | 0000007b | 00002aff | 000f1004 |
| 1755140 | 0000002c | b27cb66c | 000006ba | 00000707 | 000f0fb0 | 02000ce5 | 020046ed | 0000226f | 0000007b | 00002aff | 000f1030 | 0000002c |
| 1755220 | b27cb66c | 000006bb | 00000706 | 000f0fdc | 02000ce5 | 020046ed | 000021ef | 0000007b | 00002aff | 000f105c | 0000002c | b27cb66c |
| 1755300 | 000006bc | 00000705 | 000f1008 | 02000ce5 | 020046ed | 000034cf | 0000007b | 00002aff | 000f1088 | 0000002c | b27cb66c | 000006bd |
| 1755360 | 00000704 | 000f1034 | 02000ce5 | 020046ed | 0000470f | 0000007b | 00002aff | 000f10b4 | 0000002c | b27cb66c | 000006be | 00000703 |
| 1755440 | 000f1060 | 02000ce5 | 020046ed | 0000351f | 0000007b | 00002aff | 000f10e0 | 0000002c | b27cb66c | 000006bf | 00000702 | 000f108c |
| 1755520 | 02000ce5 | 020046ed | 0000371f | 0000007b | 00002aff | 000f110c | 0000002c | b27cb66c | 000006c1 | 00000701 | 000f10b8 | 02000ce5 |
| 1755600 | 020046ed | 0000352f | 00000083 | 00002aff | 000f1138 | 0000002c | b27cb66c | 000006c2 | 00000700 | 000f10e4 | 02000ce5 | 020046ed |

| | | | | | | | | | | | | |
|---|---|---|---|---|---|---|---|---|---|---|---|---|
| 1755660 | 00004bcf | 00000083 | 00002aff | 000f1164 | 0000002c | b27cb66c | 000006c3 | 000006ff | 000f1110 | 02000ce5 | 020046ed | 0000226f |
| 1755740 | 00000083 | 00002aff | 000f1190 | 0000002c | b27cb66c | 000006c4 | 000006fe | 000f113c | 02000ce5 | 020046ed | 000033c7 | 00000083 |
| 1756020 | 00002aff | 000f11bc | 0000002c | b27cb66c | 000006c5 | 000006fd | 000f1168 | 02000ce5 | 020046ed | 000046ff | 00000083 | 00002aff |
| 1756100 | 000f11e8 | 0000002c | b27cb66c | 000006c6 | 000006fc | 000f1194 | 02000ce5 | 020046ed | 00004bbf | 00000083 | 00002aff | 000f1214 |
| 1756160 | 0000002c | b27cb66c | 000006c7 | 000006fb | 000f11c0 | 02000ce5 | 020046ed | 000034cf | 00000083 | 00002aff | 000f1240 | 0000002c |
| 1756240 | b27cb66c | 000006c8 | 000006fa | 000f11ec | 02000ce5 | 020046ed | 0000472f | 00000083 | 00002aff | 000f126c | 0000002c | b27cb66c |
| 1756320 | 000006c9 | 000006f9 | 000f1219 | 02000ce5 | 020046ed | 00004707 | 00000083 | 00002aff | 000f1298 | 0000002c | b27cb66c | 000006ca |
| 1756400 | 000006f8 | 000f1244 | 02000ce5 | 020046ed | 00003497 | 00000083 | 00002aff | 000f12c4 | 0000002c | b27cb66c | 000006cb | 000006f7 |
| 1756460 | 000f1270 | 02000ce5 | 020046ed | 00004bb7 | 00000083 | 00002aff | 000f12f0 | 0000002c | b27cb66c | 000006cc | 000006f6 | 000f129c |
| 1756540 | 02000ce5 | 020046ed | 0000371f | 00000083 | 00002aff | 000f131c | 0000002c | b27cb66c | 000006ce | 000006f5 | 000f12c8 | 02000ce5 |
| 1756620 | 020046ed | 0000352f | 0000008b | 00002aff | 000f1348 | 0000002c | b27cb66c | 000006cf | 000006f4 | 000f12f4 | 02000ce5 | 020046ed |
| 1756700 | 000029e7 | 0000008b | 00002aff | 000f1374 | 0000002c | b27cb66c | 000006d0 | 000006f3 | 000f1320 | 02000ce5 | 020046ed | 0000226f |
| 1756760 | 0000008b | 00002aff | 000f13a0 | 0000002c | b27cb66c | 000006d1 | 000006f2 | 000f134c | 02000ce5 | 020046ed | 000033c7 | 0000008b |
| 1757040 | 00002aff | 000f13cc | 0000002c | b27cb66c | 000006d2 | 000006f1 | 000f1378 | 02000ce5 | 020046ed | 000046ff | 0000008b | 00002aff |
| 1757120 | 000f13f8 | 0000002c | b27cb66c | 000006d3 | 000006f0 | 000f13a4 | 02000ce5 | 020046ed | 00004bc7 | 0000008b | 00002aff | 000f1424 |
| 1757200 | 0000002c | b27cb66c | 000006d4 | 000006ef | 000f13d0 | 02000ce5 | 020046ed | 000034cf | 0000008b | 00002aff | 000f1450 | 0000002c |
| 1757260 | b27cb66c | 000006d5 | 000006ee | 000f13fc | 02000ce5 | 020046ed | 0000472f | 0000008b | 00002aff | 000f147c | 0000002c | b27cb66c |
| 1757340 | 000006d6 | 000006ed | 000f1428 | 02000ce5 | 020046ed | 00004707 | 0000008b | 00002aff | 000f14a8 | 0000002c | b27cb66c | 000006d7 |
| 1757420 | 000006ec | 000f1454 | 02000ce5 | 020046ed | 00003497 | 0000008b | 00002aff | 000f14d4 | 0000002c | b27cb66c | 000006d8 | 000006eb |
| 1757500 | 000f1480 | 02000ce5 | 020046ed | 0000433f | 0000008b | 00002aff | 000f1500 | 0000002c | b27cb66c | 000006d9 | 000006ea | 000f14ac |
| 1757560 | 02000ce5 | 020046ed | 0000371f | 0000008b | 00002aff | 000f152c | 0000002c | b27cb66c | 000006db | 000006e9 | 000f14d8 | 02000ce5 |
| 1757640 | 020046ed | 00003437 | 00000093 | 00002aff | 000f1558 | 0000002c | b27cb66c | 000006dc | 000006e8 | 000f1504 | 02000ce5 | 020046ed |
| 1757720 | 00004a4f | 00000093 | 00002aff | 000f1720 | 0000002c | b27cb66c | 000006dd | 000006e7 | 000f1530 | 02000ce5 | 020046ed | 0000371f |
| 1760000 | 00000093 | 00002aff | 000f4674 | 000f4740 | 000f47a0 | 000f4250 | 00000000 | 00000000 | 00000000 | 00000000 | 00000000 | 00000000 |
| 1760060 | 00000000 | 000f42e0 | 000f436c | 000f4439 | 000f44e0 | 000f456c | 0000002c | 000f15c8 | b4f0b4e4 | 000006df | 7fffffff | 000c6721 |
| 1760140 | 00000000 | 00000001 | 000f47c4 | 0002438a | 000ed610 | 00000038 | 000f15f4 | b130b66c | 000006e1 | 7fffffff | 000f1621 | 02000ce5 |
| 1760220 | 05003b75 | 00000003 | 00003eb7 | 00004a4f | 00000003 | 00004bdf | 00002aff | 0000002c | 000f162c | b4f0b4e4 | 000006e0 | 7fffffff |
| 1760300 | 000c8d49 | 00000000 | 00000001 | 000f15f4 | 0002438a | 000f4814 | 00000034 | 000f1658 | b130b66c | 000006e3 | 7fffffff | 000f168d |
| 1760360 | 02000ce5 | 030047e5 | 010047dd | 00000003 | 00003eb7 | 00004a4f | 00002aff | 0000002c | 000f168c | b4f0b4e4 | 000006e2 | 7fffffff |
| 1760440 | 000f4839 | 00000000 | 00000001 | 000f1658 | 0002438a | 000f48a0 | 0000002c | 000f04f8 | b288b66c | 000006e4 | 7fffffff | 000f04f8 |
| 1760520 | 02000ce5 | 02003ac5 | 0000000c | 00000010 | 00001f17 | 00000030 | 000ef5a4 | b27cb66c | 00000745 | 7fffffff | 000eede8 | 02000ce5 |
| 1760600 | 02003ac5 | 0000001b | 01004515 | 0000433f | 00002aff | 0000001b | b464412c | 000f16e8 | 000f48fc | 000f2028 | 00000408 | 00000000 |
| 1760660 | 00000000 | 00000000 | 00000000 | 00000000 | 00000000 | 00000000 | 00000000 | 00000000 | 00000000 | 00000000 | 00000000 | 00000000 |
| * | | | | | | | | | | | | |
| 1762640 | 00000000 | 00000000 | 00000000 | 000bfb50 | 020048b7 | 00002c07 | 00000008 | 000edc74 | 000f1b44 | 0001005e | 00000000 | 29540007 |
| 1762720 | 0002438a | 2ca00000 | 0000007c | 00000016 | 000ed428 | 000eeb9c | 0002438a | 000ee918 | 001b496c | 6c656761 | 6c206964 | 656e7469 |
| 1763000 | 66696572 | 206f6e20 | 6c696e65 | 20000000 | 00244661 | 74616c20 | 73796e74 | 61782065 | 72726f72 | 3a20756e | 65787065 | 63746564 |
| 1763060 | 20222f3d | 22200000 | 00244661 | 74616c20 | 73796e74 | 61782065 | 72726f72 | 3a20756e | 65787065 | 63746564 | 20223e3d | 22200000 |
| 1763140 | 00244661 | 74616c20 | 73796e74 | 61782065 | 72726f72 | 3a20756e | 65787065 | 63746564 | 20223c3d | 22200000 | 00234661 | 74616c20 |
| 1763220 | 73796e74 | 61782065 | 72726f72 | 3a20756e | 65787065 | 63746564 | 20223c22 | 20000000 | 00234661 | 74616c20 | 73796e74 | 61782065 |
| 1763300 | 72726f72 | 3a20756e | 65787065 | 63746564 | 20223d22 | 20000000 | 00234661 | 74616c20 | 73796e74 | 61782065 | 72726f72 | 3a20756e |
| 1763360 | 65787065 | 63746564 | 20223e22 | 20000000 | 001f4661 | 74616c20 | 73796e74 | 61782065 | 72726f72 | 3a20756e | 65787065 | 63746564 |
| 1763440 | 20000000 | 00234661 | 74616c20 | 73796e74 | 61782065 | 72726f72 | 3a20756e | 65787065 | 63746564 | 20222b22 | 20000000 | 00234661 |
| 1763520 | 74616c20 | 73796e74 | 61782065 | 72726f72 | 3a20756e | 65787065 | 63746564 | 20222d22 | 20000000 | 00234661 | 74616c20 | 73796e74 |
| 1763600 | 61782065 | 72726f72 | 3a20756e | 65787065 | 63746564 | 20222622 | 20000000 | 00234661 | 74616c20 | 73796e74 | 61792065 | 72726f72 |
| 1763660 | 3a20756e | 65787065 | 63746564 | 20222a22 | 20000000 | 00254661 | 74616c20 | 73796e74 | 61782065 | 72726f72 | 3a20756e | 65787065 |
| 1763740 | 63746564 | 20226d6f | 64222000 | 00234661 | 74616c20 | 73796e74 | 61782065 | 72726f72 | 3a20756e | 65787065 | 63746564 | 20222f22 |
| 1764020 | 20000000 | 00244661 | 74616c20 | 73796e74 | 61782065 | 72726f72 | 3a20756e | 65787065 | 63746564 | 20222a2a | 22200000 | 00254661 |
| 1764100 | 74616c20 | 73796e74 | 61782065 | 72726f72 | 3a20756e | 65787065 | 63746564 | 20226e6f | 74222000 | 0003203a | 20000000 | 00046c69 |
| 1764160 | 76650000 | 000edd34 | 00000003 | 000ee850 | 000f1dec | 00132069 | 73206120 | 72657365 | 72766564 | 20776f72 | 64000000 | ffffffff |
| 1764240 | 02003f37 | 00002c07 | 00000008 | 000eec20 | 000eec20 | 0001005e | 00000000 | 2c780028 | 0002438a | 25202ba0 | 00100016 | 3280247c |
| 1764320 | 000c658c | 00104064 | 000f1e6c | 000cc5a8 | 2c5822a0 | ffffffff | 010049e7 | 00002c07 | 00000004 | 000eecf0 | 000eecf0 | 0001005e |
| 1764400 | 00000000 | 00224d69 | 7373696e | 67207365 | 6d69636f | 6c6f6e20 | 6174206f | 72206e65 | 6172206c | 696e6520 | 00000000 | 000d7374 |
| 1764460 | 64706163 | 6b672e76 | 68646c00 | 000b636f | 6c6f6e5f | 63686563 | 6b000000 | 000e9010 | 00000010 | 000efb54 | 00000000 | 001a546f |
| 1764540 | 6b656e69 | 7a696e67 | 20746f6f | 6b207e33 | 64207365 | 632e7e6e | 000f1ec4 | 2c780028 | 0002438a | 25202ba0 | 00100016 | 3280247c |

```
1764620  000f1f2c 00104064 000f1f4c 000cc5a8 2c5822a0 ffffffff 0100416f 00002c07 00000004 000919e0 0002438a 00030000
1764700  00000000 0008081c 010049f7 00002c07 00000004 000eeda0 000eeda0 0001005e 00000000 001e4d69 7373696e 6720636f
1764760  6c6f6e20 6174206f 72206e65 6172206c 696e6520 00000000 00047668 646c0000 ffffffff 01004167 00002c07 00000004
1765040  000939e0 0002438a 00030000 00000000 00195379 6e746178 696e6720 746f6f6b 207e3364 20736563 2e7e6e00 000c447c
1765120  01004a0f 00002c07 00000004 000939e0 000efbb4 0002003b 00000000 001b5365 6d616e74 6978696e 6720746f 6f6b207e
1765200  33642073 65632e7e 6e000000 0008085c 01004a17 00002c07 00000004 000939e0 000efdc0 0002003b 00000000 000f41b0
1765260  00002008 7061636b 61676520 5354414e 44415244 2069730a 01747970 65204348 41524143 54455220 69732028 0a092720
1765340  272c2027 21272c20 2722272c 20272327 2c202724 272c2027 25272c20 2726272c 20272727 2c202728 272c2027 29272c20
1765420  272a272c 20272b27 2c20272c 272c2027 21272c20 272e272c 0a09272f 272c2027 30272c20 2731272c 20273227 2c202733
1765500  272c2027 34272c20 2735272c 20273627 2c202737 272c2027 38272c20 2739272c 20273a27 2c20273b 272c2027 3c272c20
1765560  273d272c 0a09273e 272c2027 3f272c20 2740272c 20274127 2c202742 272c2027 43272c20 2744272c 20274527 2c202746
1765640  272c2027 47272c20 2748272c 20274927 2c20274a 272c2027 4b272c20 274c272c 0a09274d 272c2027 4e272c20 274f272c
1765720  20275027 2c202751 272c2027 52272c20 2753272c 20275427 2c202755 272c2027 56272c20 2757272c 20275827 2c202759
1766000  272c2027 5a272c20 275b272c 200a0927 5c272c20 275d272c 20275e27 2c20275f 272c2027 60272c20 2761272c 20276227
1766060  2c202763 272c2027 64272c20 2765272c 20276627 2c202767 272c2027 68272c20 2769272c 20276a27 2c0a0927 6b272c20
1766140  276c272c 20276d27 2c20276e 272c2027 6f272c20 2770272c 20277127 2c202772 272c2027 73272c20 2774272c 20277527
1766220  2c202776 272c2027 77272c20 2778272c 20277927 2c0a0927 7a272c20 277b272c 20277c27 2c20277d 272c2027 7e27293b
1766300  0a747970 6520424f 4f4c4541 4e206973 20284641 4c53452c 20545255 45293b0a 74797065 20424954 20697320 28273027
1766360  2c273127 293b0a74 79706520 494e5445 47455220 69732072 616e6765 202d3235 3520746f 20323536 3b0a7375 62747970
1766440  65204e41 54555241 4c206973 20494e54 45474552 2072616e 67652030 20746f20 3235363b 0a737562 74797065 20504f53
1766520  49544956 45206973 20494e54 45474552 2072616e 67652031 20746f20 3235363b 0a747970 65204249 545f5645 43544f52
1766600  20697320 61727261 7920284e 41545552 414c2072 616e6765 203c3e29 206f6620 4249543b 0a747970 65205354 52494e47
1766660  20697320 61727261 79202850 4f534954 49564520 72616e67 65203c3e 29206f66 20434841 52414354 45523b0a 656e6420
1766740  5354414e 44415244 3b0ae813 0018000a 5648444c 2d70726f 677300b0 000002ac 0001c042 00140007 676f6f64 69657300
1767020  000002b8 00022800 00100002 4149006f 000002c8 0000082b 00140007 432d6961 636b7300 000002d4 0000b046 00100003
1767100  42534c00 000002e8 00002872 0018000a 636f6d62 2d616c69 63650009 000002fc 00028040 0018000b 6c736568 696e6974
1767160  2e646f00 00000310 0002801f 00180008 72756e2d 74696d65 00180008 00000320 00028025 00140005 6d6f6e74 65001073
1767240  00000330 00014050 00140007 6d656d63 6f6d7000 00000340 00028062 00140006 2e637465 6d700000 00000358 00028063
1767320  001c000d 2e736574 7570726f 6a2e6461 74000374 00000368 00004055 00140007 73616e64 65657000 00000380 00004052
1767400  00140006 49424d73 72630064 0000039c 00028061 00200011 2e736574 7570726f 6a2e6461 742e6261 6b007800 000003a8
1767460  000250bc 00100003 432b2b00 000003c0 0002806c 001c000d 2e617070 6f696e74 6d656e74 7300696c 000003d0 0002a80e
1767540  00140004 76746970 000003ec 000003e0 0002104a 00140004 776f726b 006d6169 000003f4 000280e0 00180009 2e656d61
1767620  63735f31 38006b65 00000400 00000058 00100003 74657800 00000410 00030851 00140007 70617273 65723000 00000424
1767700  0002806f 0018000a 73726565 2e69636f 6e32007f 00000434 0002802e 00140004 45432b2b 00001080 00000444 0002807f
1767760  00140007 2e72686f 73747300 0000045c 00028074 001c000e 44657574 63682d6e 61746c61 6e67006c 00000474 000150c8
1770040  001c000c 496e7472 6d747263 73456773 00000484 00000484 0002287e 00140005 70697474 73000494 00000494 000280b9
1770120  00140006 42757361 676e00a4 000004a4 000280b0 00140005 73616564 690004c0 000004bc 000280d0 001c000c 2e646c73
1770200  5f70726f 66696c65 00000007 000004d0 0001a112 0018000a 666f722d 70617465 6e74002e 000004e4 000040b2 00180008
1770260  69626d2d 7668646c 0070312b 000004f4 0002b02f 00140006 73616972 616d0014 00000508 0002809f 00180009 6c73692e
1770340  6c6f6769 6e00636f 0000051c 000280ed 0018000a 2e656d61 63735f39 30350064 00000530 00028035 0018000b 636f6e66
1770420  6572656e 63657300 00000540 0001c87a 00140005 70617065 72000006 00000550 00028087 00140004 2e6d6170 00180008
1770500  00000560 0001c05b 00140005 70657465 7200108f 00000578 0002000a 001c000f 6d616b65 722d7465 61706c61 74657300
1770560  0000058c 0002d080 0018000b 616c6c5f 636e5f6f 6e653100 0000059c 00016846 00140007 74706c61 74657300 000005b0
1770640  0002802c 0018000a 2e586465 6661756c 74730093 000005c4 00030005 00180008 73796e6f 70737973 00686f6e 0000051c
1770720  0001b84e 001c000c 6c736564 5f736573 73696f6e 00000600 000005e8 0002e003 00100003 6c696200 00000600 00028076
1771000  00140004 2e6c6178 001c000c 00000614 00028067 00180009 2e73756e 76696577 2d001097 00000628 0000382c 00180008
1771060  4d657373 61676573 00001098 00000634 0001906d 00100003 73633600 00000648 0003408c 0018000b 616c6c5f 696e5f6f
1771140  6e653000 00000660 00028028 001c000e 656d6169 6c5f746f 5f696e64 6961009b 00000670 0000e07c 00140005 63733330
1771220  3600109c 00000680 0002803a 00140006 6e656572 6176009d 00000690 00008085 00140007 61747472 65787300 000006a8
1771300  00028049 001c000c 45646367 2d706170 65722e66 0000109f 000006b8 0002804d 00140006 2e58696e 697400a0 000006dc
1771360  00028122 001c000d 70726f6c 6f672d66 756e6461 730010a1 000006f0 00017826 00180008 70657273 6f6e616c 00000708
1771440  00000708 00017014 00140007 70757a7a 6c657300 00000720 0002807d 001c000f 776f7264 5f616464 65722e76 68646c00
1771520  00000734 00028083 0018000a 2e66696c 656d6772 72630003 00000748 00028038 00180008 2e686973 746f7279 0000074c
1771600  00000758 000280d5 00140004 61667470 0000075c 00000770 000028d3 001c000e 73656d61 6e746963 5f636865 636b0004
1771660  00000788 00012809 00140005 63733332 33000006 0000079c 00028068 0018000a 70757a7a 6c652d61 6e730070 000007c8
```

```
1771740  00028048 00200013 45646367 24706170 65722e66 2e626163 6b757000 c00007e0 00028128 001c000c 746f2d62 652d736f
1772020  72746564 000010ad 00000800 000108d7 00140004 64617467 000010ae 0000080c 000300dc 00100003 73633400 0000082c
1772100  0000c85a 00100003 73633500 0000083c 0002811d 00140007 7668646c 2e656c00 0000094c 00028132 00140006 2e656d61
1772160  63730010 0000085c 00028136 00140007 2e656d61 63737e00 00000874 0002c00e 00140006 7075626c 69630030 00000888
1772240  0002813a 0018000a 64756d6d 792e7668 646c00b5 0000089c 00028139 0018000b 64756d6d 792e7668 646c7e00 000008b4
1772320  000168cb 001c000c 616c6c5f 696e5f6f 6e653031 00001064 000008c9 0002808f 0018000b 2e696e64 656e742e 70726f00
1772400  000008dc 000280b2 0018000b 2e6d6169 6c72632e 4f4c4400 00000a00 000210d3 001c000f 73656d61 6e746963 5f636865
1772460  636b3100 00000000 00000000 00000000 00000000 00000000 00000000 00000000 00000000 00000000 00000000 00000000
1772540  00000000 00000000 00000000 00000000 00000000 00000000 00000000 00000000 00000000 00000000 00000000 00000000
*
2005220  00000000 00000000 00000000 00000000 00000000 00000000 00000000 00000000 00000000 00012600 00014000 00014100
2005300  00014200 00014400 00014500 00014600 00014700 00014800 00014900 00014a00 00014b00 00014c00 00014d00 00014e00
2005360  00014f00 00015000 00015200 00015300 00015400 00015500 00015600 00015700 00015800 00015900 00015a00 00016000
2005440  00016700 00016800 00016a00 00016b00 00016c00 00016e00 00016f00 00017000 00017100 00017300 00017400 00017500
2005520  00017700 00017800 00017900 00017e00 0008706f 73697469 76650000 000e9068 0000000c 00000000 00000028 000f40f8
2005600  b130b66c 00000678 7fffffff 000f0525 02000ce5 01003a55 00004a3f 00002aff 000e03a4 0000005b b4640000 000ef294
2005660  000f4d34 0000007b b328414c 000ef450 00000000 00000073 b328ed31 000ef3f4 00000000 0000006b b4640000 000ef384
2005740  000f4d1c 00000063 b464d915 000ef308 000f4d28 001b756e 69745f30 5f706163 6b616765 6465636c 5f737461 6e646172
2006020  6400456c 00000083 b4640000 000ef4ac 000f4d10 0000008b b4640000 000ef578 000f4d04 000f4264 00000084 00000000
2006100  000f41c8 0000000c 000f40e4 000f41d4 0000000c 000f41ac 000f41c0 0000000c 000f41b8 000f41ec 0000000c 000f41c4
2006160  000f41f8 0000000c 000f41d0 000f4204 0000000c 000f41dc 000f4210 0000000c 000f41e8 000f421c 0000000c 000f41f4
2006240  000f4228 0000000c 000f4200 000f4244 0000000c 000f420c 00000033 b3280000 000f4db4 00000000 000f1ec8 00000010
2006320  000f0930 00000000 0000001b b3280000 000c65a8 00000000 000f42f4 00000080 00000000 000f4280 00000010 000f09b4
2006400  00000000 000f428c 0000000c 000e3064 000f4298 0000000c 00000000 000f42a8 00000010 000f0a38 00000000 000f42b4
2006460  000c000c 000f4224 000f42c4 00000010 000f0a90 00000000 000f42cc 00000008 000f42d8 0000000c 00000000 000f42f4
2006540  0000000c 00000000 0000005b b3280000 000c6638 00000000 000f4380 0000007c 000f4304 00000008 000f430c 00000008
2006620  000f4318 0000000c 000f4260 000f4328 00000010 000f0b40 00000000 000f4334 0000000c 000f427c 000f4340 0000000c
2006700  000f4288 000f434c 0000000c 000f4218 000f4358 0000000c 000f42a4 000f4364 0000000c 000f42c8 000f4380 0000000c
2006760  000f42d4 00000063 b3280000 000c65f0 00000000 000f444c 00000094 000f0fb4 00000000 000f439c 0000000c 000f4308
2007040  000f43ac 00000010 000f0ca0 00000000 000f43b4 00000008 000f43c0 0000000c 000f4324 000f43d0 00000010 000f0cf8
2007120  00000000 000f43d8 00000008 000f43e8 00000010 000f0d24 00000000 000f43f8 00000010 000f08f0 00000000 000f4408
2007200  00000010 000f0dd0 00000000 000f444c 0000000c 000f4360 00000028 000c65ec b27cb66c 000006ae 7fffffff 000f44c0
2007260  02000ce5 01003a4d 0000006b 00002aff 0000006b b3280000 000f441c 00000000 000f44f4 00000070 000f0e28 00000000
2007340  000f4464 00000008 000f4474 00000010 000f0e54 00000000 000f4480 0000000c 000f43b0 000f448c 0000000c 00000000
2007420  000f4498 0000000c 00000000 000f44a4 0000000c 00000000 000f44b0 0000000c 00000000 000f44f4 0000000c 000f4404
2007500  00000028 000f4418 b27cb66c 000006b7 7fffffff 000f454c 02000ce5 01003a4d 00000073 00002aff 00000073 b3280000
2007560  000f44c4 00000000 000f4580 00000054 00000000 000f450c 0000000c 000f4470 000f4518 0000000c 000f447c 000f4524
2007640  0000000c 000f4488 000f4530 0000000c 000f4494 000f453c 0000000c 000f44a0 000f4580 0000000c 000f44ac 00000028
2007720  000f44c0 b27cb66c 000006c0 7fffffff 000f4654 02000ce5 01003a4d 0000007b 00002aff 0000007b b3280000 000f4550
2010000  00000000 000f4688 000000d0 000f438c 000f459c 00000010 000f1114 00000000 000f45a4 00000008 000f45ac 00000008
2010060  000f45b8 0000000c 000f44fc 000f45c8 00000010 000f116c 00000000 000f45d0 00000008 000f45d8 00000008 000f45e4
2010140  0000000c 000f4330 000f45f0 0000000c 00000000 000f45fc 0000000c 000f4514 000f460c 00000010 000f121c 00000000
2010220  000f4614 00000008 000f461c 00000009 000f4628 0000000c 000f4354 000f4638 00000010 000f1274 00000000 000f4644
2010300  0000000c 00000000 000f4688 0000000c 000f4538 00000028 000f454c b27cb66c 000006cd 7fffffff 000f4720 02000ce5
2010360  01003a4d 00000083 00002aff 00000083 b3280000 000f4659 00000000 000f490c 00000094 000f457c 000f46a4 00000010
2010440  000f1324 00000000 000f46b0 0000000c 000f45a8 000f46bc 0000000c 00000000 000f46c8 0000000c 000f45d4 000f46d4
2010520  0000000c 00000000 000f46e0 0000000c 000f45ec 000f46ec 0000000c 00000000 000f46f8 0000000c 000f4618 000f4704
2010600  0000000c 00000000 000f4710 0000000c 00000000 000f4754 0000000c 000f4640 00000028 000f4654 b27cb66c 000006da
2010660  7fffffff 000f4780 02000ce5 01003a41 0000008b 00002aff 0000008b b3280000 000f4724 00000000 000c6734 00000028
2010740  000f1508 00000000 000f4770 0000000c 00000000 000f47b4 0000000c 000f470c 00000028 000f4720 b27cb66c 000006de
2011020  7fffffff 000f0959 02000ce5 01003a4d 00000093 00002aff 00000093 b3280000 000f4784 00000000 000f40e9 0000000c
2041100  00000000 00000028 000f47c4 b130b66c 000006e0 7fffffff 000f15c9 02000ce5 01003a6d 00003eb7 00002aff 00003eb7
2011160  b3280000 000f47c8 00000000 001d756e 63745f30 5f706163 6b616765 6465636c 5f737461 6e646172 645f3000 000f4818
2011240  00000003 b3280000 000f15f8 00000000 000b8bfc 030047e7 00004bdf 0000000c 000939e0 000f168c 00030000 00000000
2011320  00000028 000c20e4 b27cb66c 000006e2 7fffffff 0009a521 02000ce5 01002c35 00004bdf 00002aff 00004bdf b3280000
```

| | | | | | | | | | | | | |
|---|---|---|---|---|---|---|---|---|---|---|---|---|
| 2011400 | 000f4854 | 00000000 | 0009a549 | 00000000 | 00000000 | 000f4870 | 000a1631 | 000bde54 | 00000000 | 00000000 | 000bd9e8 | ffffffff |
| 2011460 | 02003ac7 | 00004bdf | 00000008 | 000939e0 | 000f16b8 | 00030000 | 00000000 | 000f4754 | 00000028 | b27cb66c | 000006e5 | 00000742 |
| 2011540 | 000c6738 | 02000ce5 | 01003a34 | 0000000b | 00002aff | 0000000b | b3280000 | 000f4d8c | 00000000 | b4644d38 | 000eedec | 00000000 |
| 2011620 | 00000000 | 000003fc | 000f4914 | 000f4924 | 0000000c | 000f4920 | 000f4930 | 0000000c | 000f492c | 000f493c | 0000000c | 000f4938 |
| 2011700 | 000f4948 | 0000000c | 000f4944 | 000f4954 | 0000000c | 000f4950 | 000f4960 | 0000000c | 000f495c | 000f496c | 0000000c | 000f4968 |
| 2011760 | 000f4978 | 0000000c | 000f4974 | 000f4984 | 0000000c | 000f4980 | 000f4990 | 0000000c | 000f498c | 000f499c | 0000000c | 000f4998 |
| 2012040 | 000f49a8 | 0000000c | 000f49a4 | 000f49b4 | 0000000c | 000f49b0 | 000f49c0 | 0000000c | 000f49bc | 000f49cc | 0000000c | 000f49c8 |
| 2012120 | 000f49d8 | 0000000c | 000f49d4 | 000f49e4 | 0000000c | 000f49e0 | 000f49f0 | 0000000c | 000f49ec | 000f49fc | 0000000c | 000f49f8 |
| 2012200 | 000f4a08 | 0000000c | 000f4a04 | 000f4a14 | 0000000c | 000f4a10 | 000f4a20 | 0000000c | 000f4a1c | 000f4a2c | 0000000c | 000f4a28 |
| 2012260 | 000f4a38 | 0000000c | 000f4a34 | 000f4a44 | 0000000c | 000f4a40 | 000f4a50 | 0000000c | 000f4a4c | 000f4a5c | 0000000c | 000f4a58 |
| 2012340 | 000f4a68 | 0000000c | 000f4a64 | 000f4a74 | 0000000c | 000f4a70 | 000f4a80 | 0000000c | 000f4a7c | 000f4a8c | 0000000c | 000f4a88 |
| 2012420 | 000f4a98 | 0000000c | 000f4a94 | 000f4aa4 | 0000000c | 000f4aa0 | 000f4ab0 | 0000000c | 000f4aac | 000f4abc | 0000000c | 000f4ab8 |
| 2012500 | 000f4ac8 | 0000000c | 000f4ac4 | 000f4ad4 | 0000000c | 000f4ad0 | 000f4ae0 | 0000000c | 000f4adc | 000f4aec | 0000000c | 000f4ae8 |
| 2012560 | 000f4af8 | 0000000c | 000f4af4 | 000f4b04 | 0000000c | 000f4b00 | 000f4b10 | 0000000c | 000f4b0c | 000f4b1c | 0000000c | 000f4b18 |
| 2012640 | 000f4b28 | 0000000c | 000f4b24 | 000f4b34 | 0000000c | 000f4b30 | 000f4b40 | 0000000c | 000f4b3c | 000f4b4c | 0000000c | 000f4b48 |
| 2012720 | 000f4b58 | 0000000c | 000f4b54 | 000f4b64 | 0000000c | 000f4b60 | 000f4b70 | 0000000c | 000f4b6c | 000f4b7c | 0000000c | 000f4b78 |
| 2013000 | 000f4b88 | 0000000c | 000f4b84 | 000f4b94 | 0000000c | 000f4b90 | 000f4ba0 | 0000000c | 000f4b9c | 000f4bac | 0000000c | 000f4ba8 |
| 2013060 | 000f4bb8 | 0000000c | 000f4bb4 | 000f4bc4 | 0000000c | 000f4bc0 | 000f4bd0 | 0000000c | 000f4bcc | 000f4bdc | 0000000c | 000f4bd8 |
| 2013140 | 000f4be8 | 0000000c | 000f4be4 | 000f4bf4 | 0000000c | 000f4bf0 | 000f4c00 | 0000000c | 000f4bfc | 000f4c0c | 0000000c | 000f4c08 |
| 2013220 | 000f4c18 | 0000000c | 000f4c14 | 000f4c24 | 0000000c | 000f4c20 | 000f4c30 | 0000000c | 000f4c2c | 000f4c3c | 0000000c | 000f4c38 |
| 2013300 | 000f4c48 | 0000000c | 000f4c44 | 000f4c54 | 0000000c | 000f4c50 | 000f4c60 | 0000000c | 000f4c5c | 000f4c6c | 0000000c | 000f4c68 |
| 2013360 | 000f4c78 | 0000000c | 000f4c74 | 000f4c84 | 0000000c | 000f4c80 | 000f4c90 | 0000000c | 000f4c8c | 000f4c9c | 0000000c | 000f4c98 |
| 2013440 | 000f4ca8 | 0000000c | 000f4ca4 | 000f4cb4 | 0000000c | 000f4cb0 | 000f4cc0 | 0000000c | 000f4cbc | 000f4ccc | 0000000c | 000f4cc8 |
| 2013520 | 000f4cd8 | 0000000c | 000f4cd4 | 000f4ce4 | 0000000c | 000f4ce0 | 000f4cf0 | c000000c | 00000000 | 000f4cfc | 0000000c | 00000000 |
| 2013600 | 00000000 | 0000000c | 000f47b0 | b4649068 | 000ef5a8 | 00000000 | b4644d08 | 000ef4dc | 00000000 | b4644d14 | 000ef3b4 | 00000000 |
| 2013660 | b4644d20 | 000ef338 | 00000000 | b4644d2c | 000ef2c4 | 00000000 | 0007e77c | 01003d3f | 00004bdf | 00000004 | 000939e0 | 000f04c4 |
| 2013740 | 00030009 | 00000000 | 000f418c | 000f419c | 00000000 | 000ed915 | 000f415c | 000f414c | 000f413c | 000f412c | 00000028 | 000f4d88 |
| 2014020 | b130b66c | 00000753 | 7fffffff | 000b0da1 | 02000ce5 | 01003a3d | 0000000b | 00002aff | 00000028 | 000f44b0 | b130b66c | 00000756 |
| 2014100 | 7fffffff | 000efa9d | 02000ce5 | 01003a5d | 00000003 | 00002aff | ,000f4230 | 55555555 | 0003c6b4 | 0003adc0 | 0001ba40 | 000f8228 |
| 2014160 | 000f826c | 000f9e68 | 000f9f8c | 000f9f8c | 0007f66c | f7fff0bc | f7fff0bc | 000fc000 | 000fb2a8 | 0009a000 | 000f9e70 | 00004bef |
| 2014240 | 00000013 | 001196fc | 000f9fc8 | 55555555 | 000006df | 0000022b | 000f6e12 | 0000036b | 000f6e1a | 0000030b | 000f6e22 | 0000031b |
| 2014320 | 000f6e2a | 0000039b | 000f6e32 | 000001d3 | 000f6e3a | 0000017b | 000f6e42 | 000003a3 | 000f6e4a | 0000036b | 000f6e52 | 00000383 |
| 2014400 | 000f6e5a | 0000017b | 000f6e62 | 0000028b | 000f6e6a | 00000283 | 000f6e72 | 00000393 | 000f6e7a | 0000037b | 000f6e82 | 00000363 |
| 2014460 | 000f6e8a | 0000037b | 000f6e92 | 0000033b | 000f6e9a | 00000193 | 000f6ea2 | 000001bb | 000f6eaa | 000001b3 | 000f6eb2 | 000001b3 |
| 2014540 | 00000007 | 000001d3 | 00000007 | 0000039b | 000f6eba | 0000031b | 000f6ec2 | 0000030b | 000f6eca | 0000036b | 000f6ed2 | 0000022b |
| 2014620 | 000f6eda | 0100092f | 000030c7 | 0000000b | 0000092f | 02000a57 | 0000001f | 00000007 | 02000ce7 | 000f6ee9 | 00002aff | 004d2503 |
| 2014700 | 000f6f1d | 000f6f26 | 01002a27 | 0000002b | 00000fff | 000f6f2e | 0000001f | 000f6f36 | 000f6f3d | 00000007 | 01002a27 | 00000083 |
| 2014760 | 01002a27 | 00000033 | 01002a27 | 0000007b | 03002427 | 000f6f16 | 000f6f45 | 000f6f4d | 000f6f4d | 00000007 | 000f6f45 | 000f6f66 |
| 2015040 | 000f6f16 | 000f6f6e | 00001dff | 000f6f76 | 02001f77 | 00002797 | 000030cf | 00000013 | 00001f77 | 01002c37 | 00002c07 | 02000a57 |
| 2015120 | 0000004f | 00000007 | 02000ce7 | 000f6f99 | 00002aff | 00412903 | 02000a57 | 00002c07 | 00000007 | 02000ce7 | 000f6f85 | 00002aff |
| 2015200 | 004d2c63 | 02001f77 | 0000283f | 000006df | 02000a57 | 00002c07 | 00000007 | 02000ce7 | ,000f6fd9 | 00002aff | 004d2c63 | 01001eaf |
| 2015260 | 004d2c63 | 0000039b | 000f7012 | 000003ab | 000f701a | 00000373 | 000f7022 | 000001a3 | 000f702a | 0000016b | 000f7032 | 000001a3 |
| 2015340 | 000f703a | 00000173 | 000f7042 | 00000183 | 00000007 | 00002bbf | 000030e7 | 00004e73 | 00000193 | 000f705e | 00000173 | 000f7066 |
| 2015420 | 000001ab | 00000007 | 000030ef | 000f70ae | 00000173 | 000f7042 | 0000039b | 000f7086 | 000003ab | 000f708e | 00000373 | 000f7096 |
| 2015500 | 000001a3 | 000f709e | 0000016b | 000f70a6 | 000001a3 | 00000007 | 000030f7 | 000f70de | 0000016b | 000f70a6 | 0000039b | 000f70c6 |
| 2015560 | 000003ab | 000f70ce | 00000373 | 000f70d6 | 000001a3 | 00000007 | 000006df | 00000007 | 000030d7 | 000f706e | 02001f77 | 00002a17 |
| 2015640 | 000030d7 | 02000a57 | 00002c07 | 00000007 | 02000ce7 | 000f70ed | 00002aff | 004d2c63 | 01001eaf | 004d2c63 | 02001f77 | 00002a17 |
| 2015720 | 000030ef | 02000a57 | 00002c07 | 00000007 | 02000ce7 | 000f711d | 00002aff | 004d2c63 | 01001eaf | 004d2c63 | 02001f77 | 00002a17 |
| 2016000 | 000030f7 | 02000a57 | 00002c07 | 00000007 | 02000ce7 | 000f714d | 00002aff | 004d2c63 | 01001eaf | 004d2c63 | 02001f77 | 00002a17 |
| 2016060 | 000006df | 02000a57 | 00002c07 | 00000007 | 02000ce7 | 000f717d | 00002aff | 004d2c63 | 01001eaf | 004d2c63 | 0000038b | 00000007 |
| 2016140 | 0000038b | 000f7056 | 00002127 | 00000007 | 000030ff | 000f71be | 0000038b | 000f71d6 | 00000193 | 000f71de | 00000173 | 000f71e6 |
| 2016220 | 000001ab | 00000007 | 0000017b | 000f71ce | 0000017b | 000f71fe | 0000038b | 000f7206 | 00000193 | 000f720e | 00000173 | 000f7216 |
| 2016300 | 000001ab | 000f725e | 00000343 | 000f7226 | 0000032b | 000f722e | 00000363 | 000f7236 | 00000383 | 000f723e | 0000039b | 000f7246 |
| 2016360 | 000003cb | 000f724e | 0000039b | 00000007 | 0000017b | 000f721e | 0000017b | 000f7266 | 00000343 | 000f726e | 0000032b | 000f7276 |
| 2016440 | 00000363 | 000f727e | 00000383 | 000f7286 | 0000039b | 000f728e | 000003cb | 000f7296 | 0000039b | 00000007 | 0000033b | 000f72a6 |

```
2016520  0000032b 000f72ae 00000373 000f72b6 0000032b 000f72be 00000393 000f72c6 0000034b 000f72ce 0000031b 00000007
2016600  0000033b 000f72de 0000032b 000f72e6 00000373 000f72ee 0000012b 000f72f6 00000393 000f72fe 0000034b 000f7306
2016660  0000031b 000f71f6 01002787 00003107 02001f77 00002127 000f730d 02000a57 00002c07 00000007 02000ce7 000f7315
2016740  00002aff 004d2c63 01001eaf 004d2c63 00000313 00000007 0000034b 000f7346 00000363 000f734e 00000383 000f7356
2017020  0000038b 000f735e 0000038b 000f7376 00000383 000f737e 00000363 000f7386 0000034b 000f718e 00000313 000f7056
2017100  0000310f 00000007 0000038b 000f73a6 00000383 000f73ae 00000363 000f73b6 0000034b 000f73be 00000313 000f73c6
2017160  00000193 000f73ce 00000173 000f73d6 000001ab 00000007 0000017b 000f739e 0000017b 000f73ee 0000038b 000f73f6
2017240  00000383 000f73fe 00000363 000f7406 0000034b 000f740e 00000313 000f7416 00000193 000f741e 00000173 000f7426
2017320  000001ab 00000007 0000033b 000f7436 0000032b 000f743e 00000373 000f7446 0000032b 000f744e 00000393 000f7456
2017400  0000034b 000f745e 0000031b 00000007 0000033b 000f746e 0000032b 000f7476 00000373 000f747e 0000032b 000f7486
2017460  00000393 000f748e 0000034b 000f7496 0000031b 000f73e6 01002787 00003117 02001f77 0000277f 000f749d 02000a57
2017540  00002c07 00000007 02000ce7 000f74a5 00002aff 004d2c63 01001eaf 004d2c63 02001f77 000022ff 000f74dc 01002307
2017620  000f74dc 02000ce7 000f74d5 000f74e1 02000a57 00002c07 00000007 02000937 004d4183 000f74e1 02000ce7 000f74d5
2017700  000f7501 004d2c63 01001eaf 004d2c63 0100277f 000022ff 01002307 000f7525 0000000b 00002307 01002c37 00002c07
2017760  02000ce7 000f753d 00002aff 02000ce7 000f755d 00002aff 01002c37 00002c07 02000a57 00002c07 00000007 02000ce7
2020040  000f752d 00002aff 004d45a3 0100277f 00002aaf 01002307 000f7581 02000a57 00002c07 00000007 02000ce7 000f7589
2020120  00002aff 004d45a3 01001eaf 004d45a3 00000003 00002887 02000a57 0000001f 00000007 02000ce7 00002887 00002aff
2020200  00000003 000f75e1 000f75ea 01002a27 0000002b 00000fff 000f75f2 0000001f 000f75fa 000f7601 00000007 01002a27
2020260  00000083 01002a27 00000033 01002a27 0000007b 03002427 000f75da 000f7609 000f7611 000f7611 00000007 000f7609
2020340  000f762a 000f75da 000f7632 00001dff 000f763a 01002b4f 000f764c 01002b4f 00002c07 02000a57 0000004f 00000007
2020420  02000ce7 000f7651 00002aff 004d4e63 01002b4f 00002c07 02000ce7 000f7675 00002aff 02000ce7 000f7695 00002aff
2020500  01002b4f 00002c07 01002a27 000000cb 01002a27 00000033 01002a27 0000007b 03002427 000f769d 000f76a5 000f76ad
2020560  000f76ad 00000007 000f76a5 000f76c6 000f769d 000f76ce 00001dff 000f76d6 000f76e4 000000eb 000f76f1 10002c4f
2020640  000f76f4 000f76f8 000f76fc 000f7700 000f7704 000f7708 000f770c 000f7710 000f7714 000f7719 000f771c 000f7720
2020720  000f7724 000f7728 000f772c 000f7730 01001b97 00000927 00000123 000f7746 0000032b 000f774e 00000323 000f7756
2021000  0000034b 000f775e 000003a3 000f7766 0000037b 000f776e 00000393 000f7776 000002fb 000f777e 00000363 000f7786
2021060  0000037b 000f778e 0000030b 000f7796 00000323 000f779e 000002fb 000f77a6 0000031b 000f77ae 0000037b 000f77b6
2021140  00000323 000f77be 0000032b 00000007 000f7735 000f77ce 0000098f 000f7816 01001b97 00001d7f 0000031b 000f77e6
2021220  0000037b 000f77ee 00000373 000f77f6 0000039b 000f77fe 000003ab 000f7806 00000363 000f780e 000003a3 00000007
2021300  000f77d5 000f781e 00000a3f 000f797e 01001b97 0000312f 0000017b 000f7836 00000343 000f783e 0000037b 000f7846
2021360  0000036b 000f784e 0000032b 000f7856 0000017b 000f785e 0000037b 000f7866 0000039b 000f786e 0000030b 000f7876
2021440  0000039b 000f787e 0000018b 000f7886 0000017b 000f788e 0000030b 000f7896 0000017b 000f789e 0000039b 000f78a6
2021520  00000393 000f78ae 0000032b 000f78b6 0000032b 000f78be 0000017b 000f78c6 0000039b 000f78ce 0000032b 000f78d6
2021600  0000036b 000f78de 0000030b 000f78e6 00000373 000f78ee 000003a3 000f78f6 0000034b 000f78fe 0000031b 000f7906
2021660  000002fb 000f790e 0000031b 000f7916 00000343 000f791e 0000032b 000f7926 0000031b 000f792e 0000035b 000f7936
2021740  0000018b 000f793e 0000017b 000f7946 0000036b 000f794e 0000030b 000f7956 0000034b 000f795e 00000373 000f7966
2022020  00000173 000f796e 00000383 000f7976 00000363 00000007 000f7825 000f7986 000009ff 00000007 00000a3f 000f797e
2022100  0000312f 00000007 000009ff 00000007 00001d7f 000f7996 00000927 000f79a6 02000927 00001d7f 0000312f 00002aff
2022160  0100092f 000030c7 02000ce7 000f79c5 00002aff 02000ce7 000f79e5 00002aff 0100092f 000030c7 01002b4f 00002c07
2022240  02000ce7 000f79ed 00002aff 02000ce7 000f7a0d 00002aff 01002b4f 00002c07 00001d2b 000f7a1e 00000323 00000007
2022320  001399e3 000f7a2e 00006423 00000007 0000017b 000f7a3e 000003a3 000f7a46 0000036b 000f7a4e 00000383 000f7a56
2022400  0000017b 000f7a5e 0000028b 000f7a66 00000283 000f7a6e 00000393 000f7a76 0000037b 000f7a7e 00000363 000f7a86
2022460  0000037b 000f7a8e 0000033b 000f7a96 00000193 000f7a9e 000001bb 000f7aa6 000001b3 000f7aae 000001b3 00000007
2022540  0000017b 000f7a5e 000f7ac2 0000017b 000f7aca 000003a3 000f7ad2 0000036b 000f7ada 00000383 00000007 0200095f
2022620  00000013 0000001b 0200293f 0000312f 000001db 00000013 0000293f 02000a57 00000057 00000007 02000ce7 000f7aed
2022700  00002aff 004e5443 0000017b 000f7b26 00000343 000f7b2e 0000037b 000f7b36 0000036b 000f7b3e 0000032b 000f7b46
2022760  0000017b 000f7b4e 0000037b 000f7b56 0000039b 000f7b5e 0000030b 000f7b66 0000039b 000f7b6e 0000018b 000f7b76
2023040  0000017b 000f7b7e 0000030b 000f7b86 0000017b 000f7b8e 0000039b 000f7b96 00000393 000f7b9e 0000032b 000f7ba6
2023120  0000032b 000f7bae 0000017b 000f7bb6 0000039b 000f7bbe 0000032b 000f7bc6 0000036b 000f7bce 0000030b 000f7bd6
2023200  00000373 000f7bde 000003a3 000f7be6 0000034b 000f7bee 0000031b 000f7bf6 000002fb 000f7bfe 0000031b 000f7c06
2023260  00000343 000f7c0e 0000032b 000f7c16 0000031b 000f7c1e 0000035b 000f7c26 0000018b 000f7c2e 0000017b 000f7c36
2023340  0000036b 000f7c3e 0000030b 000f7c46 0000034b 000f7c4e 00000373 000f7c56 00000173 000f7c5e 00000383 000f7c66
2023420  00000363 00000007 0000017b 000f7c36 0000017b 000f7c7e 00000343 000f7c86 0000037b 000f7c8e 0000036b 000f7c96
2023500  0000032b 000f7c9e 0000017b 000f7ca6 0000037b 000f7cae 0000039b 000f7cb6 0000030b 000f7cbe 0000039b 000f7cc6
2023560  0000018b 000f7cce 0000017b 000f7cd6 0000030b 000f7cde 0000017b 000f7ce6 0000039b 000f7cee 00000393 000f7cf6
```

| | | | | | | | | | | | | |
|---|---|---|---|---|---|---|---|---|---|---|---|---|
| 2023640 | 0000032b | 000f7cfe | 0000032b | 000f7d06 | 0000017b | 000f7d0e | 0000039b | 000f7d16 | 0000032b | 000f7d1e | 0000036b | 000f7d26 |
| 2023720 | 0000030b | 000f7d2e | 00000373 | 000f7d36 | 000003a3 | 000f7d3e | 0000034b | 000f7d46 | 0000031b | 000f7d4e | 000002fb | 000f7d56 |
| 2024000 | 0000031b | 000f7d5e | 00000343 | 000f7d66 | 0000032b | 000f7d6e | 0000031b | 000f7d76 | 0000035b | 000f7d7e | 0000018b | 00000007 |
| 2024060 | 0500236f | 00001d7f | 00001e87 | 000001db | 000f7ae1 | 0000313f | 02000a57 | 00000057 | 00000007 | 02000ce7 | 000f7d85 | 00002aff |
| 2024140 | 004e5983 | 00000007 | 10002c4f | 000f7dc0 | 000f7dc4 | 000f7dc8 | 000f7dcc | 000f7dd0 | 000f7dd4 | 000f7dd8 | 000f7ddc | 000f7de0 |
| 2024220 | 000f7de4 | 000f7de8 | 000f7dec | 000f7df0 | 000f7df4 | 000f7df8 | 000f7dfc | 01001b97 | 00000ce7 | 000f7e01 | 000f7e1a | 01001b97 |
| 2024300 | 00001d57 | 000f7e11 | 000f7e22 | 0000098f | 000f7f2a | 01001b97 | 00003147 | 000003f3 | 000f7e3a | 0000017b | 000f7e42 | 00000383 |
| 2024360 | 000f7e4a | 00000393 | 000f7e52 | 0000037b | 000f7e5a | 00000363 | 000f7e62 | 0000037b | 000f7e6a | 0000033b | 000f7e72 | 0000016b |
| 2024440 | 000f7e7a | 000003a3 | 000f7e82 | 00000393 | 000f7e8a | 0000034b | 000f7e92 | 0000030b | 000f7e9a | 00000363 | 000f7ea2 | 0000039b |
| 2024520 | 000f7eaa | 0000017b | 000f7eb2 | 00000323 | 000f7eba | 0000031b | 000f7ec2 | 000003a3 | 000f7eca | 0000033b | 000f7ed2 | 0000017b |
| 2024600 | 000f7eda | 00000323 | 000f7ee2 | 0000031b | 000f7eea | 000003a3 | 000f7ef2 | 0000033b | 000f7efa | 0000018b | 000f7f02 | 0000017b |
| 2024660 | 000f7f0a | 0000036b | 000f7f12 | 0000030b | 000f7f1a | 0000034b | 000f7f22 | 00000373 | 00000007 | 000f7e29 | 000f7f32 | 000009ff |
| 2024740 | 00000007 | 03002c3f | 00000ce7 | 00002583 | 0000203f | 02000ce7 | 000f7f39 | 00002aff | 02000ce7 | 000f7f61 | 00002aff | 03002c3f |
| 2025020 | 00000ce7 | 00002583 | 0000203f | 000009ff | 00000007 | 00003147 | 00000007 | 00001d57 | 000f7f7a | 01001d57 | 00003147 | 01000ce7 |
| 2025100 | 000f7f89 | 02001f6f | 0000312f | 000f7fa0 | 02002387 | 0000312f | 000f7fac | 02002387 | 0000312f | 00002c07 | 02000a57 | 00000057 |
| 2025160 | 00000007 | 02000ce7 | 000f7fb1 | 00002aff | 004e5e03 | 00000007 | 10002c4f | 000f7fe0 | 000f7fe4 | 000f7fe8 | 000f7fec | 000f7ff0 |
| 2025240 | 000f7ff4 | 000f7ff8 | 000f7ffc | 000f8000 | 000f8004 | 000f8008 | 000f800c | 000f8010 | 000f8014 | 000f8018 | 000f801c | 00001e9f |
| 2025320 | 00000007 | 0500236f | 00001d7f | 00001e87 | 000001db | 000f8071 | 0000313f | 02000ce7 | 000f8029 | 00002aff | 02000ce7 | 000f8059 |
| 2025400 | 00002aff | 0500236f | 00001d7f | 00001e87 | 000001db | 000f8071 | 0000313f | 0200095f | 00000013 | 0000001b | 00002d77 | 02002387 |
| 2025460 | 0000312f | 00002c07 | 02001f6f | 0000312f | 00002c07 | 02000a57 | 00000057 | 00000007 | 02000ce7 | 000f808d | 00002aff | 00507763 |
| 2025540 | 01002977 | 00507763 | 000030c7 | 05001b0f | 000f80c4 | 000f80c8 | 000f80cc | 000f80d0 | 000001db | 02001e17 | 000f80dc | 000001db |
| 2025620 | 04002d1f | 000f80e8 | 000f80ec | 000f80f0 | 000001db | 0200229f | 000f80fc | 000001db | 02001e57 | 000f8108 | 000001db | 020024df |
| 2025700 | 000f8114 | 000001db | 000c57e3 | 000f8126 | 0000010b | 00000007 | 0030b043 | 000f8136 | 00216ba3 | 00000007 | 0200095f | 00000003 |
| 2025760 | 0000000b | 00001d7f | 00000007 | 001d1663 | 00000007 | 000c3abb | 000f8152 | 000f8160 | 10002c4f | 000f8168 | 000f816c | 000f8170 |
| 2026040 | 000f8174 | 000f8178 | 000f817c | 000f8180 | 000f8184 | 000f8188 | 000f818c | 000f8190 | 000f8194 | 000f8198 | 000f819c | 000f81a0 |
| 2026120 | 000f81a4 | 01001b97 | 0000285f | 000f81a9 | 000f81ba | 0000098f | 000f81ca | 01001b97 | 00004be7 | 000f81c1 | 000f81d2 | 000009ff |
| 2026200 | 00000007 | 000009ff | 00000007 | 00004be7 | 00000007 | 0000285f | 000f81e2 | 0100285f | 00004be7 | 00000007 | 01002b4f | 00002c07 |
| 2026260 | 02000ce7 | 000f81fd | 00002aff | 02000ce7 | 000f821d | 00002aff | 01002b4f | 00002c07 | 0000285f | 04002107 | 0000285f | 0000000b |
| 2026340 | 0000001f | 00001c3f | 02000ce7 | 000f8229 | 00002aff | 02000ce7 | 000f8255 | 00002aff | 04002107 | 0000285f | 0000000b | 0000001f |
| 2026420 | 00001c3f | 000f8268 | 55555555 | 000f9ec8 | 000f9ec4 | 00093a00 | 00000000 | 00000000 | 00000000 | 00000000 | 00000000 | 0009e108 |
| 2026500 | 0006c1ac | 000f9e70 | 000939fa | 000f9e70 | 000f6e04 | 0009e108 | 0006c1ac | 000f9e70 | 000f9ea0 | 000939f8 | 000f9ea0 | 000f9eac |
| 2026560 | 000577a0 | 000f9ea0 | 000f81f1 | 00000007 | 000025a7 | 00002d8f | 00002d87 | 00000003 | 0008036c | 00000000 | 000f76a5 | 000f9ed0 |
| 2026640 | 000f9ed4 | 000025a7 | 000f9eb8 | 000579c0 | 000f9ea0 | 0003ae84 | 000f9e70 | 000f76e4 | 000f9eb8 | 00057a40 | 000f9f0c | 0007cdec |
| 2026720 | 00000000 | 000025a7 | 00000007 | 00002c07 | 000f81f1 | 000f9f0c | 00057e44 | 000f9f0c | 00057fd0 | 000f9e68 | 000f8224 | 000f9f0c |
| 2027000 | 00057e44 | 000f9f0c | 00000007 | 00000007 | 0007baec | 00000000 | 00000007 | 000025a7 | 00002c07 | 000f81f1 | 000f9f48 | 00057fb0 |
| 2027060 | 000f9f48 | 0005800c | 000f9e68 | 000f8228 | 000f9f48 | 00057fb0 | 000f9f8c | 000f8268 | 00002c07 | 00004bef | 000f9f8c | 0003adb0 |
| 2027140 | 000f9f8c | 000f9fb0 | 000f9fb4 | 00002877 | 000f9fa4 | 0003b524 | 000f9f8c | 0003b54c | 000f9e68 | 000f826c | 000f9fa4 | 0003b534 |
| 2027220 | 000f9fd4 | 000f826d | 003fb363 | 0000001b | 00002c07 | 00119708 | 00000b23 | 000f9fbc | 00030654 | 000f9fbc | 000391b4 | 000f9e68 |
| 2027300 | 000f8268 | 000f9fbc | 00030654 | 000f9fbc | 0000000b | 000f81f1 | 000f8269 | 000f9fcc | 00002c07 | 00000007 | 0000285f | 000fa010 |
| 2027360 | 0003918c | 000fa010 | 001196f5 | 003fe163 | 0000001b | 000fa014 | 00119708 | 00000d03 | 0000001b | 000fa004 | 000f8244 | 00000d23 |
| 2027440 | 0007f60c | 000707ca | 0000075c | 000f823d | 000fa048 | 00030a1c | 000fa014 | 00094bdc | 000f9e68 | 000f8249 | 000fa048 | 000f8249 |
| 2027520 | 000f9e70 | 000f81d8 | 000fa004 | 0003d8d8 | 000f9f80 | 00004be7 | 000f81e0 | 000fa0b8 | 000f81d2 | 00001f3b | 000fa02c | 000fa030 |
| 2027600 | 000fa0a4 | 0003d964 | 000fa0a4 | 000f81e4 | 000fa0b4 | 000fa0b8 | 00000007 | 000fa0a8 | 0002d4d8 | 000fa0a8 | 0002deb4 | 000f9e70 |
| 2027660 | 001197c4 | 00002c47 | 000fa0c4 | 0002dfd0 | 000fa0a8 | 000324e4 | 000f9e70 | 001197c4 | 000fa0c4 | 0002dfd0 | 000fa0a8 | 00000003 |
| 2027740 | 0000000b | 000fa0e4 | 000fa0a8 | 0002f630 | 000f9e70 | 001197c4 | 00000007 | 00000003 | 000fa114 | 0002f678 | 000fa0a8 | 0002f6e4 |
| 2030020 | 000f9e70 | 001197c4 | 00119790 | 000021e7 | 000fa11c | 0002dc1c | 000fa0a8 | 0002f220 | 000f9e70 | 000f8218 | 0007e30c | 00000000 |
| 2030100 | 000fa0b4 | 00000003 | 000f822c | 000fa0cc | 000f8254 | 000f8152 | 000f81b2 | 00000223 | 000fa0a8 | 0002d4c0 | 000fa184 | 0002d9f4 |
| 2030160 | 00154aa0 | 000f8258 | 000fa0a8 | 0002d4c0 | 000fa184 | 000f81b2 | 00000007 | 000f8268 | 000fa0cc | 00000003 | 000fa0b4 | 001d1663 |
| 2030240 | 000f822c | 000f8254 | 000f825e | 0007dd2c | 00000000 | 000fa0b4 | 000fa1d4 | 000fa1e8 | 000f8152 | 000021e7 | 000fa1c4 | 0002d99c |
| 2030320 | 000fa184 | 0002f220 | 00154aa0 | 000f826c | 0007e30c | 00154a84 | 000fa22c | 00000000 | 000fa0b4 | 00000003 | 001196f4 | 00119744 |
| 2030400 | 0011973c | 00000007 | 00000007 | 000fa0a8 | 0002d4c0 | 000fa22c | 00065fd8 | 00154a88 | 00119748 | 00003ebf | 0011d4d2 | 000fa23c |
| 2030460 | 00030c50 | 000fa23c | 000b0c00 | 00154a80 | 0012e918 | 000fa23c | 00030c50 | 000fa290 | 0012e9dd | 0012eab9 | 0012eab1 | 0012eaac |
| 2030540 | 000fa290 | 00030c50 | 000fa290 | 007a4663 | 00586d03 | 00632963 | 0012eacc | 00002c07 | 00002aff | 0011d4f9 | 0007442c | 00000000 |
| 2030620 | 000fa2c0 | 00002c07 | 0000000b | 00003a3f | 000fa2ac | 00026074 | 000fa290 | 000260cc | 00154a80 | 0012eac4 | 000fa23c | 00030c50 |
| 2030700 | 000fa304 | 0012eaa1 | 0012eab9 | 0012eab1 | 0012eaac | 000fa304 | 0011d5d8 | 000fa304 | 00000000 | 000fa318 | 0012eab1 | 00003ebf |

```
2030760  0011d5da 000fa304 00030c50 000fa304 000b0c00 00154a70 0012eb08 000fa304 00030c50 000fa358 0012eb39 0012ecf9
2031040  0012ecf1 0012ecec 000fa358 0011d690 000fa358 00000000 000fa36c 0012ecf1 00003ebf 0011d692 55555555 000f9f8c
2031120  f7fff8f0 0001a578 00000000 00000000 00000000 000f9fcc 00000007 000fa030 00000007 000fa0b4 0000000b 00000007
2031200  0012e06c 0012e0d0 0012e0a8 0012e054 0012e070 0012e088 0012e090 756e342d 342e302f 70726f6c 6f670000 00000000
2031260  00000000 00000000 00000000 00000000 00000000 00000000 00000000 00000000 00000000 00000000 2f757372 2f736861
2031340  72652f6c 69622f7a 6f6e6569 6e666f2f 6c6f6361 6c74696d 65000000 00000000 00000000 00000000 00000000 00000000
2031420  00000000 00000000 00000000 00000000 00000000 00000000 00000000 00000000 00000000 00000000 00000000 00000000
*
2032220  00000000 00000000 00000008 f77dbfd8 f77de51c 00003222 00000000 00000000 00000000 00000000 00000000 00000000
2032300  00000000 00000000 00000000 00000000 00000000 00000000 00000000 00000000 00000000 00000000 00000000 f77dec53
2032360  f7fff37c 00000000 ffffffea f77dbfd8 f77de51c 00003357 00000000 f7802e78 00000000 00000000 00000000 00000000
2032440  00000000 00000000 00000000 00000000 00000000 00000000 00000000 00000000 00000000 00000000 00000000 f77dec5b
2032520  f7fff3dc 00000000 00000000 C0000000 00000000 00000000 00000000 f7802e78 00000000 00000000 00000000 00000000
2032600  00000000 00000000 00000000 00000000 00000000 00000000 00000000 00000000 00000031 f77dbfd8 f77de51c 0000046f
2032660  00000000 00000000 00000000 00000000 00000000 00000000 00000000 00000000 00000000 00000000 00000000 00000000
2032740  00000000 00000000 00000000 00000000 30623664 61393731 f7fff484 00000000 0000000c f77dbfd8 f77de51c 000c814b
2033020  ffffffed f77dbfd8 f77de51c 00000c3a 00000000 00000000 00000000 00000000 0000001d f779f210 7fffffff f7fff500
2033100  00000003 0000005b 00000001 f77e205c f7fff664 0006eaa4 000958e1 f779e1f9 7fffffff 0000005b f7fff600 f779d190
2033160  00000003 f77dbfd8 f77de51c 0000182f 686f6d65 2f6f7361 73312f61 2f737265 652f6269 6e2f6c6f 67000100 00000000
2033240  00000000 00000000 00000000 00000000 00000000 00000000 00000000 00000000 00000000 f77de780 f7fff554 00000000
2033320  00000007 f77dbfd8 f77de51c 00003117 00000000 f7802e78 00000000 00000000 00000000 00000000 00000000 00000000
2033400  00000000 00000000 00000000 C0000000 00000000 00000000 00000000 00000000 00000000 000690d9 f7fff5b4 00000000
2033460  00000000 00000000 00000000 00000000 00000000 f7802e78 00000000 00000000 00000000 00000000 00000000 00000000
2033540  00000000 00000000 00000000 00000000 00000000 00000000 00000000 00000000 00000000 00000000 00000000 00000000
2033620  00000005 00000001 f779e304 00000000 00000040 f77e56a1 00401083 f77f2094 f7797a38 00000000 00000020 00000020
2033700  00000006 ffffef58 00096334 00000000 00096334 00000000 0000001b 00000000 f7fff678 00021da4 0000ff00 00000000
2033760  00000000 00000001 f7fff792 f7fff76d 00000026 0041a237 a891bc26 00000000 0000001d f7fff6e1 0000ffff 0000b47d
2034040  00096334 00000003 0000a9d1 00096be8 2200120a 00000000 f7fff76d 00000001 f7fff8f0 0001a548 00000000 00000000
2034120  00000000 f7fff768 f7fff764 f7fff760 f7fff6e1 f7800c30 0000000d 0000a9d1 f7202020 236f7361 636c3136 00283131
2034200  2f31342f 38382920 7077001c 00018fc2 f77de51c 00063c05 00002000 f7802e78 00000000 00000000 0000000e f77dbfd8
2034260  f77de51c 0000626d 00000010 f77dea14 f7fff74c f77fa05c f7800064 00000001 00000001 0006958d f7fff764 00069224
2034340  f7fff76c 00000003 f7802e10 f7fff7c5 0b6da971 e26dcaad a00daa76 f7613030 64616137 36206532 36646361 61642030
2034420  62366461 39373120 2020236f 7361636c 31360a00 31312f31 342f3838 29207077 0a001084 00000000 00017cc0 00010001
2034500  00000040 f815affc 00000000 ffffefb4 0009a000 00006000 00000a0b 00000000 00119980 00119980 f7fff800 00019668
2034560  00000003 00000080 f7fff810 a00daa76 2f686f6d 652f6f73 ffffffff f77dbfd8 f77de51c 00003302 64657300 81010100
2034640  0006e773 0005f820 00002800 00000000 00000073 00a00000 f7fff830 0009a072 00080ddc 01000000 00083e7c 00090ddc
2034720  00096400 0000053c 00a00000 000691ec f7fff86c 001fe000 00002800 0009a05e 00000000 00000614 f7fff890 f7802e78
2035000  00097800 00001854 00097800 00005000 0009a000 00006000 00097800 00000000 00093a88 0006ec00 0009a000 0009a000
2035060  0009a058 00000081 00000006 00000001 0000000a 0009b6b8 00000000 00000000 00027fc0 00096e30 f7fff8f0 43800000
2035140  55555555
2035144
```

```
FILE: PARTI    TIONER   A1  ***L S I   L O G I C   C O R P,   M I L P I T A S

0000000   6578 6563 202f 686f 6d65 2f6f 7361 7332 2f62 2f71 7569 6e74 7573 2f62 696e 322e 352f 7375 6e34 2334 2e30 2f70 726f 7769
0000060   6e64 6f77 7320 2b53 2024 3020 242a 0a23 0a23 2051 7569 6e74 7573 2050 726f 6c6f 6720 7361 7665 6420 7374 6174 6520 2875
0000140   6e70 7269 6e74 6162 6c65 2129 0a0a 0c0a 0a00 535c f7ff ea90 0001 4470 ffff fedc ffff fe64 000a 6d9b 000a 6d9c 0001 c45c
0000220   0000 0000 0000 0002 0000 0000 f815 d218 000a 6cf0 000a 5348 0000 008a 0000 0000 ffff efb4 ff00 0000 00ff 0000 0000 ff00
0000300   ef60 7173 0000 0070 0000 002f 7efe feff 8101 0100 000a 69f0 001a 3da6 0009 ecec 0000 2000 f810 1400 0001 0009 0300 6dcf
0000360   f815 d218 0000 05b9 000c 06e4 0000 2dcf 0010 746f 0000 09ce 0000 0001 0000 0001 0012 7754 0007 9008 000a 45f8 0002 4388
0000440   0006 de30 b7b9 8aac 322e 3500 0000 0000 0000 0000 0900 0000 000a 1928 000a a000 5555 5555 000a a000 000a a000 000a a000
0000520   001a 4850 001a 5d74 001a 6588 001a 6f7c 001a 6f7c 001a 85ec 001a 85f4 001a 8b18 001a 9c7c 001a a000 5555 5555 0000 0000
0000600   0000 0000 0000 0000 0000 0000 0000 0000 0000 0000 0000 0000 0000 0000 0000 0000 0000 0000 0000 0000 0000 0000 0000 0000
*
0003000   0000 002c 0007 9494 b4f0 b4e4 0000 0000 7fff ffff 0008 eb3d 0000 00fc 0000 0032 0007 94c0 0002 438a 000a 1a98 0000 0030
0003060   000b 92c0 b27c b66c 0000 0000 7fff ffff 0007 94f0 0200 0db5 0300 32bd 0000 0db7 0000 2583 0000 33c7 0000 315f 0000 0030
0003140   0007 94c0 b27c b66c 0000 0000 7fff ffff 0007 9520 0200 0db5 0300 32bd 0000 0adf 0000 2583 0000 33c7 0000 315f 0000 0030
0003220   0007 94f0 b27c b66c 0000 0000 7fff ffff 0007 9550 0200 0db5 0300 32bd 0000 0db7 0000 2583 0000 2327 0000 315f 0000 0030
0003300   0007 9520 b27c b66c 0000 0000 7fff ffff 0007 9580 0200 0db5 0300 32bd 0000 0e47 0000 2583 0000 2327 0000 315f 0000 0030
0003360   0007 9550 b27c b66c 0000 0000 7fff ffff 0007 95b0 0200 0db5 0300 32bd 0000 2817 0000 23f3 0000 2327 0000 315f 0000 0030
0003440   0007 9580 b27c b66c 0000 0000 7fff ffff 0007 95e0 0200 0db5 0300 32bd 0000 2c3f 0000 23f3 0000 2327 0000 315f 0000 0030
0003520   0007 95b0 b27c b66c 0000 0000 7fff ffff 0007 9610 0200 0db5 0300 32bd 0000 211f 0000 23f3 0000 2327 0000 315f 0000 0030
0003600   0007 95e0 b27c b66c 0000 0000 7fff ffff 0007 9640 0200 0db5 0300 32bd 0000 288f 0000 23f3 0000 2327 0000 315f 0000 0030
0003660   0007 9610 b27c b66c 0000 0000 7fff ffff 0007 9670 0200 0db5 0300 32bd 0000 27cf 0000 23f3 0000 2327 0000 315f 0000 0030
0003740   0007 9640 b27c b66c 0000 0000 7fff ffff 0007 96a0 0200 0db5 0300 32bd 0000 0ddf 0000 2263 0000 33cf 0000 315f 0000 0030
0004020   0007 9670 b27c b66c 0000 0000 7fff ffff 0007 96d0 0200 0db5 0300 32bd 0000 0ae7 0000 20d3 0000 33cf 0000 315f 0000 0030
0004100   0007 96a0 b27c b66c 0000 0000 7fff ffff 0007 9700 0200 0db5 0300 32bd 0000 0abf 0000 1f43 0000 33cf 0000 315f 0000 0030
0004160   0007 96d0 b27c b66c 0000 0000 7fff ffff 0007 9730 0200 0db5 0300 32bd 0000 177f 0000 1c23 0000 232f 0000 315f 0000 0030
0004240   0007 9700 b27c b66c 0000 0000 7fff ffff 0007 9760 0200 0db5 0300 32bd 0000 2f4f 0000 1c23 0000 232f 0000 315f 0000 0030
0004320   0007 9730 b27c b66c 0000 0000 7fff ffff 0007 9790 0200 0db5 0300 32bd 0000 2a27 0000 1c23 0000 232f 0000 315f 0000 0030
0004400   0007 9760 b27c b66c 0000 0000 7fff ffff 0007 97c0 0200 0db5 0300 32bd 0000 0df7 0000 15e3 0000 33c7 0000 315f 0000 0030
0004460   0007 9790 b27c b66c 0000 0000 7fff ffff 0007 97f0 0200 0db5 0300 32bd 0000 25d7 0000 15e3 0000 33c7 0000 315f 0000 0030
0004540   0007 97c0 b27c b66c 0000 0000 7fff ffff 0007 9820 0200 0db5 0300 32bd 0000 0dff 0000 15e3 0000 33c7 0000 315f 0000 0030
0004620   0007 97f0 b27c b66c 0000 0000 7fff ffff 0007 9850 0200 0db5 0300 32bd 0000 0e17 0000 15e3 0000 33c7 0000 315f 0000 0030
0004700   0007 9820 b27c b66c 0000 0000 7fff ffff 0007 9880 0200 0db5 0300 32bd 0000 178f 0000 15e3 0000 33c7 0000 315f 0000 0030
0004760   0007 9850 b27c b66c 0000 0000 7fff ffff 0007 98b0 0200 0db5 0300 32bd 0000 0e57 0000 15e3 0000 33c7 0000 315f 0000 0030
0005040   0007 9880 b27c b66c 0000 0000 7fff ffff 0007 98e0 0200 0db5 0300 32bd 0000 0e67 0000 15e3 0000 33c7 0000 315f 0000 0030
0005120   0007 98b0 b27c b66c 0000 0000 7fff ffff 0007 9910 0200 0db5 0300 32bd 0000 0e5f 0000 15e3 0000 33c7 0000 315f 0000 0030
0005200   0007 98e0 b27c b66c 0000 0000 7fff ffff 0007 9940 0200 0db5 0300 32bd 0000 0e6f 0000 15e3 0000 33c7 0000 315f 0000 0030
0005260   0007 9910 b27c b66c 0000 0000 7fff ffff 0007 9970 0200 0db5 0300 32bd 0000 0e07 0000 15e3 0000 33c7 0000 315f 0000 0030
0005340   0007 9940 b27c b66c 0000 0000 7fff ffff 0007 99a0 0200 0db5 0300 32bd 0000 0e1f 0000 15e3 0000 33c7 0000 315f 0000 0030
0005420   0007 9970 b27c b66c 0000 0000 7fff ffff 0007 99d0 0200 0db5 0300 32bd 0000 0de7 0000 15e3 0000 33c7 0000 315f 0000 0030
0005500   0007 99a0 b27c b66c 0000 0000 7fff ffff 0007 9a00 0200 0db5 0300 32bd 0000 0e27 0000 15e3 0000 33c7 0000 315f 0000 0030
0005560   0007 99d0 b27c b66c 0000 0000 7fff ffff 0007 9a30 0200 0db5 0300 32bd 0000 0e0f 0000 15e3 0000 33c7 0000 315f 0000 0030
0005640   0007 9a00 b27c b66c 0000 0000 7fff ffff 0007 9a60 0200 0db5 0300 32bd 0000 0e2f 0000 15e3 0000 33c7 0000 315f 0000 0030
0005720   0007 9a30 b27c b66c 0000 0000 7fff ffff 0007 9a90 0200 0db5 0300 32bd 0000 0daf 0000 12c3 0000 33cf 0000 315f 0000 0030
0006000   0007 9a60 b27c b66c 0000 0000 7fff ffff 0007 9ac0 0200 0db5 0300 32bd 0000 0ab7 0000 0fa3 0000 33e7 0000 315f 0000 0030
0006060   0007 9a90 b27c b66c 0000 0000 7fff ffff 0007 9af0 0200 0db5 0300 32bd 0000 0ad7 0000 0fa3 0000 33e7 0000 315f 0000 0030
0006140   0007 9ac0 b27c b66c 0000 0000 7fff ffff 0007 9b20 0200 0db5 0300 32bd 0000 1787 0000 0fa3 0000 33e7 0000 315f 0000 0030
0006220   0007 9af0 b27c b66c 0000 0000 7fff ffff 0007 9b50 0200 0db5 0300 32bd 0000 0b5f 0000 0fa3 0000 33e7 0000 315f 0000 0030
0006300   0007 9b20 b27c b66c 0000 0000 7fff ffff 0007 9b80 0200 0db5 0300 32bd 0000 0ab7 0000 0fa3 0000 2327 0000 315f 0000 0030
0006360   0007 9b50 b27c b66c 0000 0000 7fff ffff 0007 9bb0 0200 0db5 0300 32bd 0000 0ad7 0000 0fa3 0000 2327 0000 315f 0000 0030
0006440   0007 9b80 b27c b66c 0000 0000 7fff ffff 0007 9be0 0200 0db5 0300 32bd 0000 0b3f 0000 0c83 0000 33e7 0000 315f 0000 0030
0006520   0007 9bb0 b27c b66c 0000 0000 7fff ffff 0007 9c10 0200 0db5 0300 32bd 0000 0b57 0000 0c83 0000 33e7 0000 315f 0000 0030
0006600   0007 9be0 b27c b66c 0000 0000 7fff ffff 0007 9c40 0200 0db5 0300 32bd 0000 0a87 0000 0c83 0000 33e7 0000 315f 0000 0030
0006660   0007 9c10 b27c b66c 0000 0000 7fff ffff 0007 9c70 0200 0db5 0300 32bd 0000 0def 0000 0c83 0000 33e7 0000 315f 0000 0030
0006740   0007 9c40 b27c b66c 0000 0000 7fff ffff 0007 9ca0 0200 0db5 0300 32bd 0000 0e37 0000 0c83 0000 33e7 0000 315f 0000 0030
0007020   0007 9c70 b27c b66c 0000 0000 7fff ffff 0007 9cd0 0200 0db5 0300 32bd 0000 280f 0000 0963 0000 33c7 0000 315f 0000 0030
0007100   0007 9ca0 b27c b66c 0000 0000 7fff ffff 000a e4f8 0200 0db5 0300 32bd 0000 17a7 0000 0643 0000 33cf 0000 315f 0000 0000
```

```
0007160 0000 0000 0000 0000 0000 0000 0000 0000 0000 0000 0000 0000 0000 0000 0000 0000 0000 0000 0000 0000 0000 0000 0000 0000
*
0014000 0000 002c 0007 a694 b4f0 b4e4 0000 0000 7fff ffff 0008 c53d 0000 00fc 0000 0031 0007 a6c0 0002 438a 0010 3110 0000 0034
0014060 0018 22c8 b27c b66c 0000 0000 7fff ffff 0007 a6f4 0200 0db5 0400 24ad 0000 267f 0000 000b 0000 001f 0000 3287 0000 315f
0014140 0000 0034 0007 a6c0 b27c b66c 0000 0000 7fff ffff 0007 a728 0200 0db5 0400 24ad 0000 2257 0000 0013 0000 001f 0000 3287
0014220 0000 315f 0000 0034 0007 a6f4 b27c b66c 0000 0000 7fff ffff 0007 a75c 0200 0db5 0400 24ad 0000 2b6f 0000 000b 0000 001f
0014300 0000 3287 0000 315f 0000 0034 0007 a728 b27c b66c 0000 0000 7fff ffff 0007 a790 0200 0db5 0400 24ad 0000 308f 0000 0013
0014360 0000 001f 0000 3297 0000 315f 0000 0034 0007 a75c b27c b66c 0000 0000 7fff ffff 0007 a7c4 0200 0db5 0400 24ad 0000 329f
0014440 0000 0003 0000 001f 0000 3287 0000 315f 0000 0034 0007 a790 b27c b66c 0000 0000 7fff ffff 0007 e728 0200 0db5 0400 24ad
0014520 0000 3297 0000 0023 0000 001f 0000 3287 0000 315f 0000 002c 0007 a7f8 b4f0 b4e4 0000 0000 7fff ffff 0008 c47d 0000 0ffc
0014600 0000 0243 0007 a824 0002 438a 0010 2110 0000 0034 0018 c2f4 b27c b66c 0000 0000 7fff ffff 0007 a858 0200 0db5 0400 242d
0014660 0000 267f 0000 000b 0000 3287 0000 21cf 0000 315f 0000 0034 0007 a824 b27c b66c 0000 0000 7fff ffff 0007 a88c 0200 0db5
0014740 0400 242d 0000 2257 0000 0013 0000 3287 0000 21cf 0000 315f 0000 0034 0007 a858 b27c b66c 0000 0000 7fff ffff 0007 a8c0
0015020 0200 0db5 0400 242d 0000 2b6f 0000 000b 0000 3287 0000 21cf 0000 315f 0000 0034 0007 a88c b27c b66c 0000 0000 7fff ffff
0015100 0007 a8f4 0200 0db5 0400 242d 0000 308f 0000 0013 0000 3287 0000 21cf 0000 315f 0000 0034 0007 a8c0 b27c b66c 0000 0000
0015160 7fff ffff 0007 a928 0200 0db5 0400 242d 0000 329f 0000 0003 0000 3287 0000 21cf 0000 315f 0000 0034 0007 a8f4 b27c b66c
0015240 0000 0000 7fff ffff 0007 a95c 0200 0db5 0400 242d 0000 3297 0000 0023 0000 3287 0000 21cf 0000 315f 0000 0034 0007 a928
0015320 b27c b66c 0000 0000 7fff ffff 0007 a990 0200 0db5 0400 242d 0000 10df 0000 0003 0000 001f 0000 1e7f 0000 315f 0000 0034
0015400 0007 a95c b27c b66c 0000 0000 7fff ffff 0007 a9c4 0200 0db5 0400 242d 0000 111f 0000 0003 0000 001f 0000 1e7f 0000 315f
0015460 0000 0034 0007 a990 b27c b66c 0000 0000 7fff ffff 0007 a9f8 0200 0db5 0400 242d 0000 1c7f 0000 000b 0000 001f 0000 1e7f
0015540 0000 315f 0000 0034 0007 a9c4 b27c b66c 0000 0000 7fff ffff 0007 aa2c 0200 0db5 0400 242d 0000 1c7f 0000 0013 0000 001f
0015620 0000 1e7f 0000 315f 0000 0034 0007 a9f8 b27c b66c 0000 0000 7fff ffff 0007 aa60 0200 0db5 0400 242d 0000 1c87 0000 0003
0015700 0000 001f 0000 1e7f 0000 315f 0000 0034 0007 aa2c b27c b66c 0000 0000 7fff ffff 0007 aa94 0200 0db5 0400 242d 0000 1c9f
0015760 0000 0013 0000 001f 0000 1e7f 0000 315f 0000 0034 0007 aa60 b27c b66c 0000 0000 7fff ffff 0007 aac8 0200 0db5 0400 242d
0016040 0000 1cef 0000 000b 0000 0027 0000 1e7f 0000 315f 0000 0034 0007 aa94 b27c b66c 0000 0000 7fff ffff 0007 aafc 0200 0db5
0016120 0400 242d 0000 1d4f 0000 001b 0000 001f 0000 1e7f 0000 315f 0000 0034 0007 aac8 b27c b66c 0000 0000 7fff ffff 0007 ab30
0016200 0200 0db5 0400 242d 0000 1d6f 0000 000b 0000 001f 0000 1e7f 0000 315f 0000 0034 0007 aafc b27c b66c 0000 0000 7fff ffff
0016260 0007 ab64 0200 0db5 0400 242d 0000 1d6f 0000 0013 0000 001f 0000 1e7f 0000 315f 0000 0034 0007 ab30 b27c b66c 0000 0000
0016340 7fff ffff 0007 ab98 0200 0db5 0400 242d 0000 1d77 0000 000b 0000 001f 0000 1e7f 0000 315f 0000 0034 0007 ab64 b27c b66c
0016420 0000 0000 7fff ffff 0007 abcc 0200 0db5 0400 242d 0000 1d77 0000 0013 0000 001f 0000 1e7f 0000 315f 0000 0034 0007 ab98
0016500 b27c b66c 0000 0000 7fff ffff 0007 ac00 0200 0db5 0400 242d 0000 1d7f 0000 000b 0000 001f 0000 1e7f 0000 315f 0000 0034
0016560 0007 abcc b27c b66c 0000 0000 7fff ffff 0007 ac34 0200 0db5 0400 242d 0000 1d7f 0000 0013 0000 001f 0000 1e7f 0000 315f
0016640 0000 0034 0007 ac00 b27c b66c 0000 0000 7fff ffff 0007 ac68 0200 0db5 0400 242d 0000 1d8f 0000 000b 0000 001f 0000 1e7f
0016720 0000 315f 0000 0034 0007 ac34 b27c b66c 0000 0000 7fff ffff 0007 ac9c 0200 0db5 0400 242d 0000 1da7 0000 000b 0000 001f
0017000 0000 1e7f 0000 315f 0000 0034 0007 ac68 b27c b66c 0000 0000 7fff ffff 0007 acd0 0200 0db5 0400 242d 0000 1d9f 0000 0013
0017060 0000 001f 0000 1e7f 0000 315f 0000 0034 0007 ac9c b27c b66c 0000 0000 7fff ffff 0007 ad04 0200 0db5 0400 242d 0000 1de7
0017140 0000 001b 0000 001f 0000 1e7f 0000 315f 0000 0034 0007 acd0 b27c b66c 0000 0000 7fff ffff 0007 ad38 0200 0db5 0400 242d
0017220 0000 1e5f 0000 0003 0000 001f 0000 1e7f 0000 315f 0000 0034 0007 ad04 b27c b66c 0000 0000 7fff ffff 0007 ad6c 0200 0db5
0017300 0400 242d 0000 0e7f 0000 001b 0000 001f 0000 1e7f 0000 315f 0000 0034 0007 ad38 b27c b66c 0000 0000 7fff ffff 0007 ada0
0017360 0200 0db5 0400 242d 0000 1ea7 0000 000b 0000 0027 0000 1e7f 0000 315f 0000 0034 0007 ad6c b27c b66c 0000 0000 7fff ffff
0017440 0007 add4 0200 0db5 0400 242d 0000 1f67 0000 0013 0000 001f 0000 1e7f 0000 315f 0000 0034 0007 ada0 b27c b66c 0000 0000
0017520 7fff ffff 0007 ae08 0200 0db5 0400 242d 0000 1f8f 0000 0013 0000 001f 0000 1e7f 0000 315f 0000 0034 0007 add4 b27c b66c
0017600 0000 0000 7fff ffff 0007 ae3c 0200 0db5 0400 242d 0000 1f8f 0000 001b 0000 001f 0000 1e7f 0000 315f 0000 0034 0007 ae08
0017660 b27c b66c 0000 0000 7fff ffff 0007 ae70 0200 0db5 0400 242d 0000 1fa7 0000 000b 0000 001f 0000 1e7f 0000 315f 0000 0034
0017740 0007 ae3c b27c b66c 0000 0000 7fff ffff 0007 aea4 0200 0db5 0400 242d 0000 1fb7 0000 001b 0000 001f 0000 1e7f 0000 315f
0020020 0000 0034 0007 ae70 b27c b66c 0000 0000 7fff ffff 0007 aed8 0200 0db5 0400 242d 0000 1fc7 0000 000b 0000 001f 0000 1e7f
0020100 0000 315f 0000 0034 0007 aea4 b27c b66c 0000 0000 7fff ffff 0007 af0c 0200 0db5 0400 242d 0000 1fff 0000 000b 0000 001f
0020160 0000 1e7f 0000 315f 0000 0034 0007 aed8 b27c b66c 0000 0000 7fff ffff 0007 af40 0200 0db5 0400 242d 0000 2017 0000 0013
0020240 0000 001f 0000 1e7f 0000 315f 0000 0034 0007 af0c b27c b66c 0000 0000 7fff ffff 0007 af74 0200 0db5 0400 242d 0000 202f
0020320 0000 000b 0000 001f 0000 1e7f 0000 315f 0000 0034 0007 af40 b27c b66c 0000 0000 7fff ffff 0007 afa8 0200 0db5 0400 242d
0020400 0000 203f 0000 0013 0000 001f 0000 1e7f 0000 315f 0000 0034 0007 af74 b27c b66c 0000 0000 7fff ffff 0007 afdc 0200 0db5
0020460 0400 242d 0000 2047 0000 000b 0000 001f 0000 1e7f 0000 315f 0000 0034 0007 afa8 b27c b66c 0000 0000 7fff ffff 0007 b010
0020540 0200 0db5 0400 242d 0000 204f 0000 0013 0000 001f 0000 1e7f 0000 315f 0000 0034 0007 afdc b27c b66c 0000 0000 7fff ffff
0020620 0007 b044 0200 0db5 0400 242d 0000 2057 0000 000b 0000 001f 0000 1e7f 0000 315f 0000 0034 0007 b010 b27c b66c 0000 0000
0020700 7fff ffff 0007 b078 0200 0db5 0400 242d 0000 2057 0000 0013 0000 001f 0000 1e7f 0000 315f 0000 0034 0007 b044 b27c b66c
```

```
0020760 0000 0000 7fff ffff 0007 b0ac 0200 0db5 0400 242d 0000 205f 0000 001b 0000 001f 0000 1e7f 0000 315f 0000 0034 0007 b078
0021040 b27c b66c 0000 0000 7fff ffff 0007 b0e0 0200 0db5 0400 242d 0000 2067 0000 000b 0000 001f 0000 1e7f 0000 315f 0000 0034
0021120 0007 b0ac b27c b66c 0000 0000 7fff ffff 0007 b114 0200 0db5 0400 242d 0000 206f 0000 0013 0000 001f 0000 1e7f 0000 315f
0021200 0000 0034 0007 b0e0 b27c b66c 0000 0000 7fff ffff 0007 b148 0200 0db5 0400 242d 0000 2077 0000 001b 0000 001f 0000 1e7f
0021260 0000 315f 0000 0034 0007 b114 b27c b66c 0000 0000 7fff ffff 0007 b17c 0200 0db5 0400 242d 0000 208f 0000 0003 0000 0027
0021340 0000 1e7f 0000 315f 0000 0034 0007 b148 b27c b66c 0000 0000 7fff ffff 0007 b1b0 0200 0db5 0400 242d 0000 2097 0000 0003
0021420 0000 0027 0000 1e7f 0000 315f 0000 0034 0007 b17c b27c b66c 0000 0000 7fff ffff 0007 b1e4 0200 0db5 0400 242d 0000 20af
0021500 0000 000b 0000 0027 0000 1e7f 0000 315f 0000 0034 0007 b1b0 b27c b66c 0000 0000 7fff ffff 0007 b218 0200 0db5 0400 242d
0021560 0000 20f7 0000 000b 0000 001f 0000 1e7f 0000 315f 0000 0034 0007 b1e4 b27c b66c 0000 0000 7fff ffff 0007 b24c 0200 0db5
0021640 0400 242d 0000 211f 0000 000b 0000 001f 0000 1e7f 0000 315f 0000 0034 0007 b218 b27c b66c 0000 0000 7fff ffff 0007 b280
0021720 0200 0db5 0400 242d 0000 2177 0000 000b 0000 001f 0000 1e7f 0000 315f 0000 0034 0007 b24c b27c b66c 0000 0000 7fff ffff
0022000 0007 b2b4 0200 0db5 0400 242d 0000 2187 0000 000b 0000 001f 0000 1e7f 0000 315f 0000 0034 0007 b280 b27c b66c 0000 0000
0022060 7fff ffff 0007 b2e8 0200 0db5 0400 242d 0000 21bf 0000 0013 0000 001f 0000 1e7f 0000 315f 0000 0034 0007 b2b4 b27c b66c
0022140 0000 0000 7fff ffff 0007 b31c 0200 0db5 0400 242d 0000 21ef 0000 0003 0000 001f 0000 1e7f 0000 315f 0000 0034 0007 b2e8
0022220 b27c b66c 0000 0000 7fff ffff 0007 b350 0200 0db5 0400 242d 0000 222f 0000 0003 0000 001f 0000 1e7f 0000 315f 0000 0034
0022300 0007 b31c b27c b66c 0000 0000 7fff ffff 0007 b384 0200 0db5 0400 242d 0000 225f 0000 0003 0000 001f 0000 1e7f 0000 315f
0022360 0000 0034 0007 b350 b27c b66c 0000 0000 7fff ffff 0007 b3b8 0200 0db5 0400 242d 0000 2287 0000 001b 0000 001f 0000 1e7f
0022440 0000 315f 0000 0034 0007 b384 b27c b66c 0000 0000 7fff ffff 0007 b3ec 0200 0db5 0400 242d 0000 229f 0000 000b 0000 001f
0022520 0000 1e7f 0000 315f 0000 0034 0007 b3b8 b27c b66c 0000 0000 7fff ffff 0007 b420 0200 0db5 0400 242d 0000 22af 0000 000b
0022600 0000 001f 0000 1e7f 0000 315f 0000 0034 0007 b3ec b27c b66c 0000 0000 7fff ffff 0007 b454 0200 0db5 0400 242d 0000 22f7
0022660 0000 0013 0000 0037 0000 1e7f 0000 315f 0000 0034 0007 b420 b27c b66c 0000 0000 7fff ffff 0007 b488 0200 0db5 0400 242d
0022740 0000 22f7 0000 001b 0000 0037 0000 1e7f 0000 315f 0000 0034 0007 b454 b27c b66c 0000 0000 7fff ffff 0007 b4bc 0200 0db5
0023020 0400 242d 0000 231f 0000 001b 0000 001f 0000 1e7f 0000 315f 0000 0034 0007 b488 b27c b66c 0000 0000 7fff ffff 0007 b4f0
0023100 0200 0db5 0400 242d 0000 2347 0000 0003 0000 001f 0000 1e7f 0000 315f 0000 0034 0007 b4bc b27c b66c 0000 0000 7fff ffff
0023160 0007 b524 0200 0db5 0400 242d 0000 2357 0000 0003 0000 001f 0000 1e7f 0000 315f 0000 0034 0007 b4f0 b27c b66c 0000 0000
0023240 7fff ffff 0007 b558 0200 0db5 0400 242d 0000 2387 0000 001b 0000 001f 0000 1e7f 0000 315f 0000 0034 0007 b524 b27c b66c
0023320 0000 0000 7fff ffff 0007 b58c 0200 0db5 0400 242d 0000 23a7 0000 000b 0000 001f 0000 1e7f 0000 315f 0000 0034 0007 b558
0023400 b27c b66c 0000 0000 7fff ffff 0007 b5c0 0200 0db5 0400 242d 0000 23a7 0000 0013 0000 001f 0000 1e7f 0000 315f 0000 0034
0023460 0007 b58c b27c b66c 0000 0000 7fff ffff 0007 b5f4 0200 0db5 0400 242d 0000 23af 0000 000b 0000 001f 0000 1e7f 0000 315f
0023540 0000 0034 0007 b5c0 b27c b66c 0000 0000 7fff ffff 0007 b628 0200 0db5 0400 242d 0000 23af 0000 0013 0000 001f 0000 1e7f
0023620 0000 315f 0000 0034 0007 b5f4 b27c b66c 0000 0000 7fff ffff 0007 b65c 0200 0db5 0400 242d 0000 2427 0000 0003 0000 001f
0023700 0000 1e7f 0000 315f 0000 0034 0007 b628 b27c b66c 0000 0000 7fff ffff 0007 b690 0200 0db5 0400 242d 0000 2447 0000 0003
0023760 0000 001f 0000 1e7f 0000 315f 0000 0034 0007 b65c b27c b66c 0000 0000 7fff ffff 0007 b6c4 0200 0db5 0400 242d 0000 2447
0024040 0000 000b 0000 001f 0000 1e7f 0000 315f 0000 0034 0007 b690 b27c b66c 0000 0000 7fff ffff 0007 b6f8 0200 0db5 0400 242d
0024120 0000 24df 0000 000b 0000 0027 0000 1e7f 0000 315f 0000 0034 0007 b6c4 b27c b66c 0000 0000 7fff ffff 0007 b72c 0200 0db5
0024200 0400 242d 0000 2527 0000 0013 0000 001f 0000 1e7f 0000 315f 0000 0034 0007 b6f8 b27c b66c 0000 0000 7fff ffff 0007 b760
0024260 0200 0db5 0400 242d 0000 253f 0000 000b 0000 001f 0000 1e7f 0000 315f 0000 0034 0007 b72c b27c b66c 0000 0000 7fff ffff
0024340 0007 b794 0200 0db5 0400 242d 0000 2547 0000 0013 0000 001f 0000 1e7f 0000 315f 0000 0034 0007 b760 b27c b66c 0000 0000
0024420 7fff ffff 0007 b7c8 0200 0db5 0400 242d 0000 2617 0000 0013 0000 001f 0000 1e7f 0000 315f 0000 0034 0007 b794 b27c b66c
0024500 0000 0000 7fff ffff 0007 b7fc 0200 0db5 0400 242d 0000 2637 0000 000b 0000 0027 0000 1e7f 0000 315f 0000 0034 0007 b7c8
0024560 b27c b66c 0000 0000 7fff ffff 0007 b830 0200 0db5 0400 242d 0000 2657 0000 0013 0000 001f 0000 1e7f 0000 315f 0000 0034
0024640 0007 b7fc b27c b66c 0000 0000 7fff ffff 0007 b864 0200 0db5 0400 242d 0000 2687 0000 0013 0000 001f 0000 1e7f 0000 315f
0024720 0000 0034 0007 b830 b27c b66c 0000 0000 7fff ffff 0007 b898 0200 0db5 0400 242d 0000 268f 0000 0013 0000 001f 0000 1e7f
0025000 0000 315f 0000 0034 0007 b864 b27c b66c 0000 0000 7fff ffff 0007 b8cc 0200 0db5 0400 242d 0000 26bf 0000 0003 0000 001f
0025060 0000 1e7f 0000 315f 0000 0034 0007 b898 b27c b66c 0000 0000 7fff ffff 0007 b900 0200 0db5 0400 242d 0000 26bf 0000 000b
0025140 0000 001f 0000 1e7f 0000 315f 0000 0034 0007 b8cc b27c b66c 0000 0000 7fff ffff 0007 b934 0200 0db5 0400 242d 0000 26df
0025220 0000 0013 0000 002f 0000 1e7f 0000 315f 0000 0034 0007 b900 b27c b66c 0000 0000 7fff ffff 0007 b968 0200 0db5 0400 242d
0025300 0000 26df 0000 001b 0000 002f 0000 1e7f 0000 315f 0000 0034 0007 b934 b27c b66c 0000 0000 7fff ffff 0007 b99c 0200 0db5
0025360 0400 242d 0000 2727 0000 0003 0000 001f 0000 1e7f 0000 315f 0000 0034 0007 b968 b27c b66c 0000 0000 7fff ffff 0007 b9d0
0025440 0200 0db5 0400 242d 0000 275f 0000 0003 0000 001f 0000 1e7f 0000 315f 0000 0034 0007 b99c b27c b66c 0000 0000 7fff ffff
0025520 0007 ba04 0200 0db5 0400 242d 0000 275f 0000 000b 0000 001f 0000 1e7f 0000 315f 0000 0034 0007 b9d0 b27c b66c 0000 0000
0025600 7fff ffff 0007 ba38 0200 0db5 0400 242d 0000 278f 0000 000b 0000 0027 0000 1e7f 0000 315f 0000 0034 0007 ba04 b27c b66c
0025660 0000 0000 7fff ffff 0007 ba6c 0200 0db5 0400 242d 0000 27cf 0000 000b 0000 001f 0000 1e7f 0000 315f 0000 0034 0007 ba38
0025740 b27c b66c 0000 0000 7fff ffff 0007 baa0 0200 0db5 0400 242d 0000 2817 0000 000b 0000 001f 0000 1e7f 0000 315f 0000 0034
0026020 0007 ba6c b27c b66c 0000 0000 7fff ffff 0007 bad4 0200 0db5 0400 242d 0000 2827 0000 000b 0000 001f 0000 1e7f 0000 315f
```

```
0026100  0000 0034 0007 baa0 b27c b66c 0000 0000 7fff ffff 0007 bb08 0200 0db5 0400 242d 0000 2827 0000 0013 0000 001f 0000 1e7f
0026160  0000 315f 0000 0034 0007 bad4 b27c b66c 0000 0000 7fff ffff 0007 bb3c 0200 0db5 0400 242d 0000 288f 0000 000b 0000 001f
0026240  0000 1e7f 0000 315f 0000 0034 0007 bb08 b27c b66c 0000 0000 7fff ffff 0007 bb70 0200 0db5 0400 242d 0000 2897 0000 000b
0026320  0000 001f 0000 1e7f 0000 315f 0000 0034 0007 bb3c b27c b66c 0000 0000 7fff ffff 0007 bba4 0200 0db5 0400 242d 0000 2927
0026400  0000 0013 0000 001f 0000 1e7f 0000 315f 0000 0034 0007 bb70 b27c b66c 0000 0000 7fff ffff 0007 bbd8 0200 0db5 0400 242d
0026460  0000 2987 0000 0003 0000 001f 0000 1e7f 0000 315f 0000 0034 0007 bba4 b27c b66c 0000 0000 7fff ffff 0007 bc0c 0200 0db5
0026540  0400 242d 0000 2987 0000 000b 0000 001f 0000 1e7f 0000 315f 0000 0034 0007 bbd8 b27c b66c 0000 0000 7fff ffff 0007 bc40
0026620  0200 0db5 0400 242d 0000 29c7 0000 0003 0000 0027 0000 1e7f 0000 315f 0000 0034 0007 bc0c b27c b66c 0000 0000 7fff ffff
0026700  0007 bc74 0200 0db5 0400 242d 0000 29cf 0000 0003 0000 001f 0000 1e7f 0000 315f 0000 0034 0007 bc40 b27c b66c 0000 0000
0026760  7fff ffff 0007 bca8 0200 0db5 0400 242d 0000 29d7 0000 0003 0000 001f 0000 1e7f 0000 315f 0000 0034 0007 bc74 b27c b66c
0027040  0000 0000 7fff ffff 0007 bcdc 0200 0db5 0400 242d 0000 29df 0000 0003 0000 001f 0000 1e7f 0000 315f 0000 0034 0007 bca8
0027120  b27c b66c 0000 0000 7fff ffff 0007 bd10 0200 0db5 0400 242d 0000 2a07 0000 000b 0000 001f 0000 1e7f 0000 315f 0000 0034
0027200  0007 bcdc b27c b66c 0000 0000 7fff ffff 0007 bd44 0200 0db5 0400 242d 0000 2a27 0000 000b 0000 0027 0000 1e7f 0000 315f
0027260  0000 0034 0007 bd10 b27c b66c 0000 0000 7fff ffff 0007 bd78 0200 0db5 0400 242d 0000 2a2f 0000 0003 0000 0027 0000 1e7f
0027340  0000 315f 0000 0034 0007 bd44 b27c b66c 0000 0000 7fff ffff 0007 bdac 0200 0db5 0400 242d 0000 2a3f 0000 0003 0000 0027
0027420  0000 1e7f 0000 315f 0000 0034 0007 bd78 b27c b66c 0000 0000 7fff ffff 0007 bde0 0200 0db5 0400 242d 0000 29bf 0000 000b
0027500  0000 001f 0000 1e7f 0000 315f 0000 0034 0007 bdac b27c b66c 0000 0000 7fff ffff 0007 be14 0200 0db5 0400 242d 0000 2a57
0027560  0000 000b 0000 001f 0000 1e7f 0000 315f 0000 0034 0007 bde0 b27c b66c 0000 0000 7fff ffff 0007 be48 0200 0db5 0400 242d
0027640  0000 2a67 0000 001b 0000 001f 0000 1e7f 0000 315f 0000 0034 0007 be14 b27c b66c 0000 0000 7fff ffff 0007 be7c 0200 0db5
0027720  0400 242d 0000 2a5f 0000 0013 0000 001f 0000 1e7f 0000 315f 0000 0034 0007 be48 b27c b66c 0000 0000 7fff ffff 0007 beb0
0030000  0200 0db5 0400 242d 0000 2ad7 0000 001b 0000 001f 0000 1e7f 0000 315f 0000 0034 0007 be7c b27c b66c 0000 0000 7fff ffff
0030060  0007 bee4 0200 0db5 0400 242d 0000 2ae7 0000 001b 0000 001f 0000 1e7f 0000 315f 0000 0034 0007 beb0 b27c b66c 0000 0000
0030140  7fff ffff 0007 bf18 0200 0db5 0400 242d 0000 2aef 0000 000b 0000 001f 0000 1e7f 0000 315f 0000 0034 0007 bee4 b27c b66c
0030220  0000 0000 7fff ffff 0007 bf4c 0200 0db5 0400 242d 0000 2b07 0000 0003 0000 001f 0000 1e7f 0000 315f 0000 0034 0007 bf18
0030300  b27c b66c 0000 0000 7fff ffff 0007 bf80 0200 0db5 0400 242d 0000 2b47 0000 0013 0000 001f 0000 1e7f 0000 315f 0000 0034
0030360  0007 bf4c b27c b66c 0000 0000 7fff ffff 0007 bfb4 0200 0db5 0400 242d 0000 2b47 0000 001b 0000 001f 0000 1e7f 0000 315f
0030440  0000 0034 0007 bf80 b27c b66c 0000 0000 7fff ffff 0007 bfe8 0200 0db5 0400 242d 0000 2b5f 0000 000b 0000 001f 0000 1e7f
0030520  0000 315f 0000 0034 0007 bfb4 b27c b66c 0000 0000 7fff ffff 0007 c01c 0200 0db5 0400 242d 0000 2b77 0000 000b 0000 001f
0030600  0000 1e7f 0000 315f 0000 0034 0007 bfe8 b27c b66c 0000 0000 7fff ffff 0007 c050 0200 0db5 0400 242d 0000 2baf 0000 0013
0030660  0000 001f 0000 1e7f 0000 315f 0000 0034 0007 c01c b27c b66c 0000 0000 7fff ffff 0007 c084 0200 0db5 0400 242d 0000 2bcf
0030740  0000 000b 0000 001f 0000 1e7f 0000 315f 0000 0034 0007 c050 b27c b66c 0000 0000 7fff ffff 0007 c0b8 0200 0db5 0400 242d
0031020  0000 2bcf 0000 0013 0000 001f 0000 1e7f 0000 315f 0000 0034 0007 c084 b27c b66c 0000 0000 7fff ffff 0007 c0ec 0200 0db5
0031100  0400 242d 0000 2bff 0000 0013 0000 001f 0000 1e7f 0000 315f 0000 0034 0007 c0b8 b27c b66c 0000 0000 7fff ffff 0007 c120
0031160  0200 0db5 0400 242d 0000 2bff 0000 001b 0000 001f 0000 1e7f 0000 315f 0000 0034 0007 c0ec b27c b66c 0000 0000 7fff ffff
0031240  0007 c154 0200 0db5 0400 242d 0000 2c07 0000 0013 0000 001f 0000 1e7f 0000 315f 0000 0034 0007 c120 b27c b66c 0000 0000
0031320  7fff ffff 0007 c188 0200 0db5 0400 242d 0000 2c0f 0000 0013 0000 001f 0000 1e7f 0000 315f 0000 0034 0007 c154 b27c b66c
0031400  0000 0000 7fff ffff 0007 c1bc 0200 0db5 0400 242d 0000 2c3f 0000 000b 0000 001f 0000 1e7f 0000 315f 0000 0034 0007 c188
0031460  b27c b66c 0000 0000 7fff ffff 0007 c1f0 0200 0db5 0400 242d 0000 2c47 0000 000b 0000 001f 0000 1e7f 0000 315f 0000 0034
0031540  0007 c1bc b27c b66c 0000 0000 7fff ffff 0007 c224 0200 0db5 0400 242d 0000 2c47 0000 0013 0000 001f 0000 1e7f 0000 315f
0031620  0000 0034 0007 c1f0 b27c b66c 0000 0000 7fff ffff 0007 c258 0200 0db5 0400 242d 0000 2ccf 0000 000b 0000 001f 0000 1e7f
0031700  0000 315f 0000 0034 0007 c224 b27c b66c 0000 0000 7fff ffff 0007 c28c 0200 0db5 0400 242d 0000 2ccf 0000 0013 0000 001f
0031760  0000 1e7f 0000 315f 0000 0034 0007 c258 b27c b66c 0000 0000 7fff ffff 0007 c2c0 0200 0db5 0400 242d 0000 2d0f 0000 000b
0032040  0000 001f 0000 1e7f 0000 315f 0000 0034 0007 c28c b27c b66c 0000 0000 7fff ffff 0007 c2f4 0200 0db5 0400 242d 0000 2d17
0032120  0000 001b 0000 001f 0000 1e7f 0000 315f 0000 0034 0007 c2c0 b27c b66c 0000 0000 7fff ffff 0007 c328 0200 0db5 0400 242d
0032200  0000 2d1f 0000 001b 0000 001f 0000 1e7f 0000 315f 0000 0034 0007 c2f4 b27c b66c 0000 0000 7fff ffff 0007 c35c 0200 0db5
0032260  0400 242d 0000 2d27 0000 001b 0000 001f 0000 1e7f 0000 315f 0000 0034 0007 c328 b27c b66c 0000 0000 7fff ffff 0007 c390
0032340  0200 0db5 0400 242d 0000 2d3f 0000 0003 0000 001f 0000 1e7f 0000 315f 0000 0034 0007 c35c b27c b66c 0000 0000 7fff ffff
0032420  0007 c3c4 0200 0db5 0400 242d 0000 2d4f 0000 0003 0000 001f 0000 1e7f 0000 315f 0000 0034 0007 c390 b27c b66c 0000 0000
0032500  7fff ffff 0007 c3f8 0200 0db5 0400 242d 0000 2d5f 0000 000b 0000 001f 0000 1e7f 0000 315f 0000 0034 0007 c3c4 b27c b66c
0032560  0000 0000 7fff ffff 0007 c42c 0200 0db5 0400 242d 0000 2d5f 0000 0013 0000 002f 0000 1e7f 0000 315f 0000 0034 0007 c3f8
0032640  b27c b66c 0000 0000 7fff ffff 0007 c460 0200 0db5 0400 242d 0000 2d77 0000 000b 0000 001f 0000 1e7f 0000 315f 0000 0034
0032720  0007 c42c b27c b66c 0000 0000 7fff ffff 0007 c494 0200 0db5 0400 242d 0000 2d87 0000 000b 0000 001f 0000 1e7f 0000 315f
0033000  0000 0034 0007 c460 b27c b66c 0000 0000 7fff ffff 0007 c4c8 0200 0db5 0400 242d 0000 2d9f 0000 0013 0000 001f 0000 1e7f
0033060  0000 315f 0000 0034 0007 c494 b27c b66c 0000 0000 7fff ffff 0007 c4fc 0200 0db5 0400 242d 0000 2dcf 0000 000b 0000 001f
0033140  0000 1e7f 0000 315f 0000 0034 0007 c4c8 b27c b66c 0000 0000 7fff ffff 0007 c530 0200 0db5 0400 242d 0000 2dcf 0000 0013
```

| | | | | | | | | | | | | | | | | | | | | | | | | |
|---|---|---|---|---|---|---|---|---|---|---|---|---|---|---|---|---|---|---|---|---|---|---|---|---|
| 0033220 | 0000 | 001f | 0000 | 1e7f | 0000 | 315f | 0000 | 0034 | 0007 | c4fc | b27c | b66c | 0000 | 0000 | 7fff | ffff | 0007 | c564 | 0200 | 0db5 | 0400 | 242d | 0000 | 2ddf |
| 0033300 | 0000 | 000b | 0000 | 001f | 0000 | 1e7f | 0000 | 315f | 0000 | 0034 | 0007 | c530 | b27c | b66c | 0000 | 0000 | 7fff | ffff | 0007 | c598 | 0200 | 0db5 | 0400 | 242d |
| 0033360 | 0000 | 2e07 | 0000 | 000b | 0000 | 001f | 0000 | 1e7f | 0000 | 315f | 0000 | 0034 | 0007 | c564 | b27c | b66c | 0000 | 0000 | 7fff | ffff | 0007 | c5cc | 0200 | 0db5 |
| 0033440 | 0400 | 242d | 0000 | 2e0f | 0000 | 000b | 0000 | 001f | 0000 | 1e7f | 0000 | 315f | 0000 | 0034 | 0007 | c598 | b27c | b66c | 0000 | 0000 | 7fff | ffff | 0007 | c600 |
| 0033520 | 0200 | 0db5 | 0400 | 242d | 0000 | 2e17 | 0000 | 0003 | 0000 | 001f | 0000 | 1e7f | 0000 | 315f | 0000 | 0034 | 0007 | c5cc | b27c | b66c | 0000 | 0000 | 7fff | ffff |
| 0033600 | 0007 | c634 | 0200 | 0db5 | 0400 | 242d | 0000 | 2e97 | 0000 | 000b | 0000 | 001f | 0000 | 1e7f | 0000 | 315f | 0000 | 0034 | 0007 | c600 | b27c | b66c | 0000 | 0000 |
| 0033660 | 7fff | ffff | 0007 | c668 | 0200 | 0db5 | 0400 | 242d | 0000 | 2ea7 | 0000 | 000b | 0000 | 001f | 0000 | 1e7f | 0000 | 315f | 0000 | 0034 | 0007 | c634 | b27c | b66c |
| 0033740 | 0000 | 0000 | 7fff | ffff | 0007 | c69c | 0200 | 0db5 | 0400 | 242d | 0000 | 2eaf | 0000 | 001b | 0000 | 001f | 0000 | 1e7f | 0000 | 315f | 0000 | 0034 | 0007 | c668 |
| 0034020 | b27c | b66c | 0000 | 0000 | 7fff | ffff | 0007 | c6d0 | 0200 | 0db5 | 0400 | 242d | 0000 | 2ef7 | 0000 | 000b | 0000 | 001f | 0000 | 1e7f | 0000 | 315f | 0000 | 0034 |
| 0034100 | 0007 | c69c | b27c | b66c | 0000 | 0000 | 7fff | ffff | 0007 | c704 | 0200 | 0db5 | 0400 | 242d | 0000 | 2ef7 | 0000 | 0013 | 0000 | 001f | 0000 | 1e7f | 0000 | 315f |
| 0034160 | 0000 | 0034 | 0007 | c6d0 | b27c | b66c | 0000 | 0000 | 7fff | ffff | 0007 | c738 | 0200 | 0db5 | 0400 | 242d | 0000 | 2f1f | 0000 | 0013 | 0000 | 001f | 0000 | 1e7f |
| 0034240 | 0000 | 315f | 0000 | 0034 | 0007 | c704 | b27c | b66c | 0000 | 0000 | 7fff | ffff | 0007 | c76c | 0200 | 0db5 | 0400 | 242d | 0000 | 2f2f | 0000 | 000b | 0000 | 001f |
| 0034320 | 0000 | 1e7f | 0000 | 315f | 0000 | 0034 | 0007 | c738 | b27c | b66c | 0000 | 0000 | 7fff | ffff | 0007 | c7a0 | 0200 | 0db5 | 0400 | 242d | 0000 | 2f2f | 0000 | 0013 |
| 0034400 | 0000 | 001f | 0000 | 1e7f | 0000 | 315f | 0000 | 0034 | 0007 | c76c | b27c | b66c | 0000 | 0000 | 7fff | ffff | 0007 | c7d4 | 0200 | 0db5 | 0400 | 242d | 0000 | 2f4f |
| 0034460 | 0000 | 000b | 0000 | 0027 | 0000 | 1e7f | 0000 | 315f | 0000 | 0034 | 0007 | c7a0 | b27c | b66c | 0000 | 0000 | 7fff | ffff | 0007 | c808 | 0200 | 0db5 | 0400 | 242d |
| 0034540 | 0000 | 2f8f | 0000 | 0003 | 0000 | 001f | 0000 | 1e7f | 0000 | 315f | 0000 | 0034 | 0007 | c7d4 | b27c | b66c | 0000 | 0000 | 7fff | ffff | 0007 | c83c | 0200 | 0db5 |
| 0034620 | 0400 | 242d | 0000 | 2f8f | 0000 | 0013 | 0000 | 001f | 0000 | 1e7f | 0000 | 315f | 0000 | 0034 | 0007 | c808 | b27c | b66c | 0000 | 0000 | 7fff | ffff | 0007 | c870 |
| 0034700 | 0200 | 0db5 | 0400 | 242d | 0000 | 2fb7 | 0000 | 0013 | 0000 | 001f | 0000 | 1e7f | 0000 | 315f | 0000 | 0034 | 0007 | c83c | b27c | b66c | 0000 | 0000 | 7fff | ffff |
| 0034760 | 0007 | c8a4 | 0200 | 0db5 | 0400 | 242d | 0000 | 2fbf | 0000 | 0013 | 0000 | 001f | 0000 | 1e7f | 0000 | 315f | 0000 | 0034 | 0007 | c870 | b27c | b66c | 0000 | 0000 |
| 0035040 | 7fff | ffff | 0007 | c8d8 | 0200 | 0db5 | 0400 | 242d | 0000 | 2fbf | 0000 | 001b | 0000 | 001f | 0000 | 1e7f | 0000 | 315f | 0000 | 0034 | 0007 | c8a4 | b27c | b66c |
| 0035120 | 0000 | 0000 | 7fff | ffff | 0007 | c90c | 0200 | 0db5 | 0400 | 242d | 0000 | 2fef | 0000 | 000b | 0000 | 001f | 0000 | 1e7f | 0000 | 315f | 0000 | 0034 | 0007 | c8d8 |
| 0035200 | b27c | b66c | 0000 | 0000 | 7fff | ffff | 0007 | c940 | 0200 | 0db5 | 0400 | 242d | 0000 | 2ff7 | 0000 | 000b | 0000 | 0027 | 0000 | 1e7f | 0000 | 315f | 0000 | 0034 |
| 0035260 | 0007 | c90c | b27c | b66c | 0000 | 0000 | 7fff | ffff | 0007 | c974 | 0200 | 0db5 | 0400 | 242d | 0000 | 2fff | 0000 | 0013 | 0000 | 001f | 0000 | 1e7f | 0000 | 315f |
| 0035340 | 0000 | 0034 | 0007 | c940 | b27c | b66c | 0000 | 0000 | 7fff | ffff | 0007 | c9a8 | 0200 | 0db5 | 0400 | 242d | 0000 | 3047 | 0000 | 000b | 0000 | 001f | 0000 | 1e7f |
| 0035420 | 0000 | 315f | 0000 | 0034 | 0007 | c974 | b27c | b66c | 0000 | 0000 | 7fff | ffff | 0007 | c9dc | 0200 | 0db5 | 0400 | 242d | 0000 | 3047 | 0000 | 0013 | 0000 | 001f |
| 0035500 | 0000 | 1e7f | 0000 | 315f | 0000 | 0034 | 0007 | c9a8 | b27c | b66c | 0000 | 0000 | 7fff | ffff | 0007 | ca10 | 0200 | 0db5 | 0400 | 242d | 0000 | 3067 | 0000 | 000b |
| 0035560 | 0000 | 001f | 0000 | 1e7f | 0000 | 315f | 0000 | 0034 | 0007 | c9dc | b27c | b66c | 0000 | 0000 | 7fff | ffff | 0007 | ca44 | 0200 | 0db5 | 0400 | 242d | 0000 | 306f |
| 0035640 | 0000 | 000b | 0000 | 001f | 0000 | 1e7f | 0000 | 315f | 0000 | 0034 | 0007 | ca10 | b27c | b66c | 0000 | 0000 | 7fff | ffff | 0007 | ca78 | 0200 | 0db5 | 0400 | 242d |
| 0035720 | 0000 | 30e7 | 0000 | 0003 | 0000 | 001f | 0000 | 1e7f | 0000 | 315f | 0000 | 0034 | 0007 | ca44 | b27c | b66c | 0000 | 0000 | 7fff | ffff | 0007 | caac | 0200 | 0db5 |
| 0036000 | 0400 | 242d | 0000 | 310f | 0000 | 0003 | 0000 | 0027 | 0000 | 1e7f | 0000 | 315f | 0000 | 0034 | 0007 | ca78 | b27c | b66c | 0000 | 0000 | 7fff | ffff | 0007 | cae0 |
| 0036060 | 0200 | 0db5 | 0400 | 242d | 0000 | 3157 | 0000 | 0003 | 0000 | 001f | 0000 | 1e7f | 0000 | 315f | 0000 | 0034 | 0007 | caac | b27c | b66c | 0000 | 0000 | 7fff | ffff |
| 0036140 | 0007 | cb14 | 0200 | 0db5 | 0400 | 242d | 0000 | 315f | 0000 | 0003 | 0000 | 001f | 0000 | 1e7f | 0000 | 315f | 0000 | 0034 | 0007 | cae0 | b27c | b66c | 0000 | 0000 |
| 0036220 | 7fff | ffff | 0007 | cb48 | 0200 | 0db5 | 0400 | 242d | 0000 | 3177 | 0000 | 0003 | 0000 | 001f | 0000 | 1e7f | 0000 | 315f | 0000 | 0034 | 0007 | cb14 | b27c | b66c |
| 0036300 | 0000 | 0000 | 7fff | ffff | 0007 | cb7c | 0200 | 0db5 | 0400 | 242d | 0000 | 317f | 0000 | 000b | 0000 | 001f | 0000 | 1e7f | 0000 | 315f | 0000 | 0034 | 0007 | cb48 |
| 0036360 | b27c | b66c | 0000 | 0000 | 7fff | ffff | 0007 | cbb0 | 0200 | 0db5 | 0400 | 242d | 0000 | 3187 | 0000 | 000b | 0000 | 001f | 0000 | 1e7f | 0000 | 315f | 0000 | 0034 |
| 0036440 | 0007 | cb7c | b27c | b66c | 0000 | 0000 | 7fff | ffff | 0007 | cbe4 | 0200 | 0db5 | 0400 | 242d | 0000 | 318f | 0000 | 0003 | 0000 | 001f | 0000 | 1e7f | 0000 | 315f |
| 0036520 | 0000 | 0034 | 0007 | cbb0 | b27c | b66c | 0000 | 0000 | 7fff | ffff | 0007 | cc18 | 0200 | 0db5 | 0400 | 242d | 0000 | 3197 | 0000 | 000b | 0000 | 001f | 0000 | 1e7f |
| 0036600 | 0000 | 315f | 0000 | 0034 | 0007 | cbe4 | b27c | b66c | 0000 | 0000 | 7fff | ffff | 0007 | cc4c | 0200 | 0db5 | 0400 | 242d | 0000 | 319f | 0000 | 000b | 0000 | 001f |
| 0036660 | 0000 | 1e7f | 0000 | 315f | 0000 | 0034 | 0007 | cc18 | b27c | b66c | 0000 | 0000 | 7fff | ffff | 0007 | cc80 | 0200 | 0db5 | 0400 | 242d | 0000 | 31a7 | 0000 | 000b |
| 0036740 | 0000 | 001f | 0000 | 1e7f | 0000 | 315f | 0000 | 0034 | 0007 | cc4c | b27c | b66c | 0000 | 0000 | 7fff | ffff | 0007 | ccb4 | 0200 | 0db5 | 0400 | 242d | 0000 | 3237 |
| 0037020 | 0000 | 000b | 0000 | 001f | 0000 | 1e7f | 0000 | 315f | 0000 | 0034 | 0007 | cc80 | b27c | b66c | 0000 | 0000 | 7fff | ffff | 0007 | cce8 | 0200 | 0db5 | 0400 | 242d |
| 0037100 | 0000 | 323f | 0000 | 0013 | 0000 | 001f | 0000 | 1e7f | 0000 | 315f | 0000 | 0034 | 0007 | ccb4 | b27c | b66c | 0000 | 0000 | 7fff | ffff | 0007 | cd1c | 0200 | 0db5 |
| 0037160 | 0400 | 242d | 0000 | 3277 | 0000 | 000b | 0000 | 001f | 0000 | 1e7f | 0000 | 315f | 0000 | 0034 | 0007 | cce8 | b27c | b66c | 0000 | 0000 | 7fff | ffff | 0007 | cd50 |
| 0037240 | 0200 | 0db5 | 0400 | 242d | 0000 | 3277 | 0000 | 0013 | 0000 | 001f | 0000 | 1e7f | 0000 | 315f | 0000 | 0034 | 0007 | cd1c | b27c | b66c | 0000 | 0000 | 7fff | ffff |
| 0037320 | 0007 | cd84 | 0200 | 0db5 | 0400 | 2421 | 0000 | 3277 | 0000 | 001b | 0000 | 001f | 0000 | 1e7f | 0000 | 315f | 0000 | 0034 | 0007 | cd50 | b27c | b66c | 0000 | 0000 |
| 0037400 | 7fff | ffff | 0007 | cdb8 | 0200 | 0db5 | 0400 | 242d | 0000 | 32df | 0000 | 000b | 0000 | 001f | 0000 | 1e7f | 0000 | 315f | 0000 | 0034 | 0007 | cd84 | b27c | b66c |
| 0037460 | 0000 | 0000 | 7fff | ffff | 0007 | cdec | 0200 | 0db5 | 0400 | 242d | 0000 | 3317 | 0000 | 0003 | 0000 | 001f | 0000 | 1e7f | 0000 | 315f | 0000 | 0034 | 0007 | cdb8 |
| 0037540 | b27c | b66c | 0000 | 0000 | 7fff | ffff | 0007 | ce20 | 0200 | 0db5 | 0400 | 242d | 0000 | 3317 | 0000 | 000b | 0000 | 001f | 0000 | 1e7f | 0000 | 315f | 0000 | 0034 |
| 0037620 | 0007 | cdec | b27c | b66c | 0000 | 0000 | 7fff | ffff | 0007 | ce54 | 0200 | 0db5 | 0400 | 242d | 0000 | 331f | 0000 | 000b | 0000 | 001f | 0000 | 1e7f | 0000 | 315f |
| 0037700 | 0000 | 0034 | 0007 | ce20 | b27c | b66c | 0000 | 0000 | 7fff | ffff | 0007 | ce88 | 0200 | 0db5 | 0400 | 242d | 0000 | 331f | 0000 | 0013 | 0000 | 001f | 0000 | 1e7f |
| 0037760 | 0000 | 315f | 0000 | 0034 | 0007 | ce54 | b27c | b66c | 0000 | 0000 | 7fff | ffff | 0007 | cebc | 0200 | 0db5 | 0400 | 242d | 0000 | 3387 | 0000 | 000b | 0000 | 001f |
| 0040040 | 0000 | 1e7f | 0000 | 315f | 0000 | 0034 | 0007 | ce88 | b27c | b66c | 0000 | 0000 | 7fff | ffff | 0007 | cef0 | 0200 | 0db5 | 0400 | 242d | 0000 | 3387 | 0000 | 0013 |
| 0040120 | 0000 | 001f | 0000 | 1e7f | 0000 | 315f | 0000 | 0034 | 0007 | cebc | b27c | b66c | 0000 | 0000 | 7fff | ffff | 0007 | cf24 | 0200 | 0db5 | 0400 | 242d | 0000 | 33a7 |
| 0040200 | 0000 | 000b | 0000 | 001f | 0000 | 1e7f | 0000 | 315f | 0000 | 0034 | 0007 | cef0 | b27c | b66c | 0000 | 0000 | 7fff | ffff | 0007 | cf58 | 0200 | 0db5 | 0400 | 242d |
| 0040260 | 0000 | 33a7 | 0000 | 0013 | 0000 | 001f | 0000 | 1e7f | 0000 | 315f | 0000 | 0034 | 0007 | cf24 | b27c | b66c | 0000 | 0000 | 7fff | ffff | 0007 | cf8c | 0200 | 0db5 |

```
0040340 0400 242d 0000 339f 0000 000b 0000 c01f 0000 1e7f c000 315f 0000 0034 0007 cf58 b27c b66c 0000 0000 7fff ffff 0007 cfc0
0040420 0200 0db5 0400 242d 0000 339f 0000 0013 0000 001f 0000 1e7f 0000 315f 0000 0034 0007 cf8c b27c b66c 0000 0000 7fff ffff
0040500 0007 cff4 0200 0db5 0400 242d 0000 177f 0000 000b 0000 001f 0000 1e7f 0000 315f 0000 0034 0007 cfc0 b27c b66c 0000 0000
0040560 7fff ffff 0007 d028 0200 0db5 0400 242d 0000 17a7 0000 0013 0000 001f 0000 1e7f 0000 315f 0000 0034 0007 cff4 b27c b66c
0040640 0000 0000 7fff ffff 0007 d05c 0200 0db5 0400 242d 0000 0e07 0000 0013 0000 001f 0000 1e7f 0000 315f 0000 0034 0007 d028
0040720 b27c b66c 0000 0000 7fff ffff 0007 d090 0200 0db5 0400 242d 0000 0e1f 0000 0013 0000 001f 0000 1e7f 0000 315f 0000 0034
0041000 0007 d05c b27c b66c 0000 0000 7fff ffff 0007 d0c4 0200 0db5 0400 242d 0000 0de7 0000 0013 0000 001f 0000 1e7f 0000 315f
0041060 0000 0034 0007 d090 b27c b66c 0000 0000 7fff ffff 0007 d0f8 0200 0db5 0400 242d 0000 0e0f 0000 0013 0000 001f 0000 1e7f
0041140 0000 315f 0000 0034 0007 d0c4 b27c b66c 0000 0000 7fff ffff 0007 d12c 0200 0db5 0400 242d 0000 0e27 0000 0013 0000 001f
0041220 0000 1e7f 0000 315f 0000 0034 0007 d0f8 b27c b66c 0000 0000 7fff ffff 0007 d160 0200 0db5 0400 242d 0000 0e2f 0000 0013
0041300 0000 001f 0000 1e7f 0000 315f 0000 0034 0007 d12c b27c b66c 0000 0000 7fff ffff 0007 d194 0200 0db5 0400 242d 0000 0df7
0041360 0000 0013 0000 001f 0000 1e7f 0000 315f 0000 0034 0007 d160 b27c b66c 0000 0000 7fff ffff 0007 d1c8 0200 0db5 0400 242d
0041440 0000 0dff 0000 0013 0000 001f 0000 1e7f 0000 315f 0000 0034 0007 d194 b27c b66c 0000 0000 7fff ffff 0007 d1fc 0200 0db5
0041520 0400 242d 0000 0e17 0000 0013 0000 001f 0000 1e7f 0000 315f 0000 0034 0007 d1c8 b27c b66c 0000 0000 7fff ffff 0007 d230
0041600 0200 0db5 0400 242d 0000 178f 0000 0013 0000 001f 0000 1e7f 0000 315f 0000 0034 0007 d1fc b27c b66c 0000 0000 7fff ffff
0041660 0007 d264 0200 0db5 0400 242d 0000 0e57 0000 0013 0000 001f 0000 1e7f 0000 315f 0000 0034 0007 d230 b27c b66c 0000 0000
0041740 7fff ffff 0007 d298 0200 0db5 0400 242d 0000 0e5f 0000 0013 0000 001f 0000 1e7f 0000 315f 0000 0034 0007 d264 b27c b66c
0042020 0000 0000 7fff ffff 0007 d2cc 0200 0db5 0400 242d 0000 0e67 0000 0013 0000 001f 0000 1e7f 0000 315f 0000 0034 0007 d298
0042100 b27c b66c 0000 0000 7fff ffff 0007 d300 0200 0db5 0400 242d 0000 0e6f 0000 0013 0000 001f 0000 1e7f 0000 315f 0000 0034
0042160 0007 d2cc b27c b66c 0000 0000 7fff ffff 0007 d334 0200 0db5 0400 242d 0000 000f 0000 0013 0000 001f 0000 1e7f 0000 315f
0042240 0000 0034 0007 d300 b27c b66c 0000 0000 7fff ffff 0007 d368 0200 0db5 0400 242d 0000 0daf 0000 0013 0000 0027 0000 1e7f
0042320 0000 315f 0000 0034 0007 d334 b27c b66c 0000 0000 7fff ffff 0007 d39c 0200 0db5 0400 242d 0000 0007 0000 0003 0000 001f
0042400 0000 1e7f 0000 315f 0000 0034 0007 d368 b27c b66c 0000 0000 7fff ffff 0007 d3d0 0200 0db5 0400 242d 0000 083f 0000 0003
0042460 0000 001f 0000 1e7f 0000 315f 0000 0034 0007 d39c b27c b66c 0000 0000 7fff ffff 0007 d404 0200 0db5 0400 242d 0000 0abf
0042540 0000 0013 0000 001f 0000 1e7f 0000 315f 0000 0034 0007 d3d0 b27c b66c 0000 0000 7fff ffff 0007 d438 0200 0db5 0400 242d
0042620 0000 0ddf 0000 0013 0000 001f 0000 1e7f 0000 315f 0000 0034 0007 d404 b27c b66c 0000 0000 7fff ffff 0007 d46c 0200 0db5
0042700 0400 242d 0000 0ae7 0000 0013 0000 001f 0000 1e7f 0000 315f 0000 0034 0007 d438 b27c b66c 0000 0000 7fff ffff 0007 d4a0
0042760 0200 0db5 0400 242d 0000 0e47 0000 000b 0000 001f 0000 1e7f 0000 315f 0000 0034 0007 d46c b27c b66c 0000 0000 7fff ffff
0043040 0007 d4d4 0200 0db5 0400 242d 0000 0db7 0000 000b 0000 001f 0000 1e7f 0000 315f 0000 0034 0007 d4a0 b27c b66c 0000 0000
0043120 7fff ffff 0007 d508 0200 0db5 0400 242d 0000 04b7 0000 0013 0000 001f 0000 1e7f 0000 315f 0000 0034 0007 d4d4 b27c b66c
0043200 0000 0000 7fff ffff 0007 d53c 0200 0db5 0400 242d 0000 0917 0000 000b 0000 001f 0000 1e7f 0000 315f 0000 0034 0007 d508
0043260 b27c b66c 0000 0000 7fff ffff 0007 d570 0200 0db5 0400 242d 0000 08c7 0000 000b 0000 001f 0000 1e7f 0000 315f 0000 0034
0043340 0007 d53c b27c b66c 0000 0000 7fff ffff 0007 d5a4 0200 0db5 0400 242d 0000 090f 0000 0013 0000 001f 0000 1e7f 0000 315f
0043420 0000 0034 0007 d570 b27c b66c 0000 0000 7fff ffff 0007 d5d8 0200 0db5 0400 242d 0000 08df 0000 000b 0000 001f 0000 1e7f
0043500 0000 315f 0000 0034 0007 d5a4 b27c b66c 0000 0000 7fff ffff 0007 d60c 0200 0db5 0400 242d 0000 0907 0000 001b 0000 001f
0043560 0000 1e7f 0000 315f 0000 0034 0007 d5d8 b27c b66c 0000 0000 7fff ffff 0007 d640 0200 0db5 0400 242d 0000 08f7 0000 001b
0043640 0000 001f 0000 1e7f 0000 315f 0000 0034 0007 d60c b27c b66c 0000 0000 7fff ffff 0007 d674 0200 0db5 0400 242d 0000 08ff
0043720 0000 0013 0000 001f 0000 1e7f 0000 315f 0000 0034 0007 d640 b27c b66c 0000 0000 7fff ffff 0007 d6a8 0200 0db5 0400 242d
0044000 0000 08e7 0000 0023 0000 001f 0000 1e7f 0000 315f 0000 0034 0007 d674 b27c b66c 0000 0000 7fff ffff 0007 e0ac 0200 0db5
0044060 0400 242d 0000 08ef 0000 000b 0000 001f 0000 1e7f 0000 315f 0000 002c 0007 d6dc b4f0 b4e4 0000 0000 7fff ffff 0008 cc3d
0044140 0000 01fc 0000 005c 0007 d708 000a 215c 000d 85f0 0000 0030 0018 c420 b27c b66c 0000 0000 7fff ffff 0007 d738 0200 0db5
0044220 0200 2855 0100 1ea5 0000 0003 0000 0027 0000 315f 0000 0030 0007 d708 b27c b66c 0000 0000 7fff ffff 0007 d768 0200 0db5
0044300 0200 2855 0100 24dd 0000 0003 0000 0027 0000 315f 0000 0034 0007 d738 b27c b66c 0000 0000 7fff ffff 0007 d79c 0200 0db5
0044360 0200 2855 0200 17a5 0000 0ad7 0000 0003 0000 001f 0000 315f 0000 0030 0007 d768 b27c b66c 0000 0000 7fff ffff 0007 d7cc
0044440 0200 0db5 0200 2855 0100 2f4d 0000 0daf 0000 0027 0000 315f 0000 0030 0007 d79c b27c b66c 0000 0000 7fff ffff 0007 d7fc
0044520 0200 0db5 0200 2855 0100 2a25 0000 0daf 0000 0027 0000 315f 0000 0034 0007 d7cc b27c b66c 0000 0000 7fff ffff 0007 d830
0044600 0200 0db5 0200 2855 0200 2b45 0000 0013 0000 0e3f 0000 001f 0000 315f 0000 0038 0007 d7fc b27c b66c 0000 0000 7fff ffff
0044660 0007 d868 0200 0db5 0200 2855 0300 2b45 0000 0013 0000 0e3f 0000 0e3f 0000 001f 0000 315f 0000 0038 0007 d830 b27c b66c
0044740 0000 0000 7fff ffff 0007 d8a0 0200 0db5 0200 2855 0300 2ead 0000 0ab7 0000 0003 0000 0e3f 0000 001f 0000 315f 0000 0038
0045020 0007 d868 b27c b66c 0000 0000 7fff ffff 0007 d8d8 0200 0db5 0200 2855 0300 1de5 0000 0ab7 0000 0003 0000 0e3f 0000 001f
0045100 0000 315f 0000 0038 0007 d8a0 b27c b66c 0000 0000 7fff ffff 0007 d910 0200 0db5 0200 2855 0300 2285 0000 0ab7 0000 0003
0045160 0000 0e3f 0000 001f 0000 315f 0000 0030 0007 d8d8 b27c b66c 0000 0000 7fff ffff 0007 d940 0200 0db5 0200 2855 0100 1d6d
0045240 0000 0daf 0000 001f 0000 315f 0000 0034 0007 d910 b27c b66c 0000 0000 7fff ffff 0007 d974 0200 0db5 0200 2855 0200 1d6d
0045320 0000 0daf 0000 04d7 0000 001f 0000 315f 0000 0030 0007 d940 b27c b66c 0000 0000 7fff ffff 0007 d9a4 0200 0db5 0200 2855
0045400 0100 1d75 0000 01af 0000 001f 0000 315f 0000 0034 0007 d974 b27c b66c 0000 0000 7fff ffff 0007 d9d8 0200 0db5 0200 2855
```

```
0045460  0200 1d75 0000 0daf 0000 0ad7 0000 001f 0000 315f 0000 0030 0007 d9a4 b27c b66c 0000 0000 7fff ffff 0007 da08 0200 0db5
0045540  0200 2855 0100 1d7d 0000 0daf 0000 001f 0000 315f 0000 0034 0007 d9d8 b27c b66c 0000 0000 7fff ffff 0007 da3c 0200 0db5
0045620  0200 2855 0200 1d7d 0000 0daf 0000 0ad7 0000 001f 0000 315f 0000 0030 0007 da08 b27c b66c 0000 0000 7fff ffff 0007 da6c
0045700  0200 0db5 0200 2855 0100 2d75 0000 0daf 0000 001f 0000 315f 0000 0030 0007 da3c b27c b66c 0000 0000 7fff ffff 0007 da9c
0045760  0200 0db5 0200 2855 0100 2d85 0000 0003 0000 001f 0000 315f 0000 0034 0007 da6c b27c b66c 0000 0000 7fff ffff 0007 dad0
0046040  0200 0db5 0200 2855 0200 1f8d 0000 0daf 0000 0e3f 0000 001f 0000 315f 0000 0038 0007 da9c b27c b66c 0000 0000 7fff ffff
0046120  0007 db08 0200 0db5 0200 2855 0300 1f8d 0000 01af 0000 0e3f 0000 0e3f 0000 001f 0000 315f 0000 0030 0007 dad0 b27c b66c
0046200  0000 0000 7fff ffff 0007 db38 0200 0db5 0200 2855 0100 1c7d 0000 0daf 0000 001f 0000 315f 0000 0034 0007 db08 b27c b66c
0046260  0000 0000 7fff ffff 0007 db6c 0200 0db5 0200 2855 0200 1c7d 0000 0daf 0000 0ab7 0000 001f 0000 315f 0000 0034 0007 db38
0046340  b27c b66c 0000 0000 7fff ffff 0007 dba0 0200 0db5 0200 2855 0200 206d 0000 0e3f 0000 0003 0000 001f 0000 315f 0000 0034
0046420  0007 db6c b27c b66c 0000 0000 7fff ffff 0007 dbd4 0200 0db5 0200 2855 0200 2f2d 0000 0003 0000 0e3f 0000 001f 0000 315f
0046500  0000 0034 0007 dba0 b27c b66c 0000 0000 7fff ffff 0007 dc08 0200 0db5 0200 2855 0200 2bad 0000 0001 0000 0e3f 0000 001f
0046560  0000 315f 0000 0030 0007 dbd4 b27c b66c 0000 0000 7fff ffff 0007 dc38 0200 0db5 0200 2855 0100 26bd 0000 0daf 0000 001f
0046640  0000 315f 0000 0030 0007 dc08 b27c b66c 0000 0000 7fff ffff 0007 dc68 0200 0db5 0200 2855 0100 1ffd 0000 0daf 0000 001f
0046720  0000 315f 0000 0034 0007 dc38 b27c b66c 0000 0000 7fff ffff 0007 dc9c 0200 0db5 0200 2855 0000 0001 0000 0daf 0000 0ab7
0047000  0000 001f 0000 315f 0000 0030 0007 dc68 b27c b66c 0000 0000 7fff ffff 0007 dccc 0200 0db5 0200 2855 0100 1fc5 0000 0daf
0047060  0000 001f 0000 315f 0000 0030 0007 dc9c b27c b66c 0000 0000 7fff ffff 0007 dcfc 0200 0db5 0200 2855 0100 2175 0000 0daf
0047140  0000 001f 0000 315f 0000 0030 0007 dccc b27c b66c 0000 0000 7fff ffff 0007 dd2c 0200 0db5 0200 2855 0100 3275 0000 0daf
0047220  0000 001f 0000 315f 0000 0034 0007 dcfc b27c b66c 0000 0000 7fff ffff 0007 dd60 0200 0db5 0200 2855 0200 3275 0000 0daf
0047300  0000 0ab7 0000 001f 0000 315f 0000 0038 0007 dd2c b27c b66c 0000 0000 7fff ffff 0007 dd98 0200 0db5 0200 2855 0300 3275
0047360  0000 0ab7 0000 0daf 0000 0ab7 0000 001f 0000 315f 0000 0034 0007 dd60 b27c b66c 0000 0000 7fff ffff 0007 ddcc 0200 0db5
0047440  0200 2855 0200 26dd 0000 0daf 0000 0ab7 0000 002f 0000 315f 0000 0038 0007 dd98 b27c b66c 0000 0000 7fff ffff 0007 de04
0047520  0200 0db5 0200 2855 0300 26dd 0000 0daf 0000 0ab7 0000 0ab7 0000 002f 0000 315f 0000 0038 0007 ddcc b27c b66c 0000 0000
0047600  7fff ffff 0007 de3c 0200 0db5 0200 2855 0300 0905 0000 0daf 0000 0daf 0000 0daf 0000 001f 0000 315f 0000 003c 0007 de04
0047660  b27c b66c 0000 0000 7fff ffff 0007 de78 0200 0db5 0200 2855 0400 08e5 0000 0ab7 0000 0ab7 0000 0ab7 0000 0003 0000 001f
0047740  0000 315f 0000 0030 0007 de3c b27c b66c 0000 0000 7fff ffff 0007 f1c0 0200 0db5 0200 2855 0100 2895 0000 0daf 0000 001f
0050020  0000 315f 0000 0000 0000 0000 0000 0000 0000 0000 0000 0000 0000 0000 0000 0000 0000 0000 0000 0000 0000 0000 0000 0000
0050100  0000 002c 0007 ded4 b4f0 b4e4 0000 0000 7fff ffff 0008 c55d 0000 003c 0000 000a 0007 df00 0002 438a 0013 f988 0000 002c
0050160  0018 c193 b27c b66c 0000 0000 7fff ffff 0007 df2c 0200 0db5 0200 24bd 0000 3287 0000 2c27 0000 315f 0000 002c 0007 df00
0050240  b27c b66c 0000 0000 7fff ffff 0007 df58 0200 0db5 0200 24bd 0000 3287 0000 255f 0000 315f 0000 002c 0007 df2c b27c b66c
0050320  0000 0000 7fff ffff 0007 df84 0200 0db5 0200 24bd 0000 3287 0000 20cf 0000 315f 0000 002c 0007 df58 b27c b66c 0000 0000
0050400  7fff ffff 0007 f2e0 0200 0db5 0200 24bd 0000 3287 0000 27c7 0000 315f 0000 0000 0000 0000 0000 0000 0000 0000 0000 0000
0050460  0000 0000 0000 0000 0000 0000 0000 0000 0000 002c 0007 dfd4 b4f0 b4e4 0000 0000 7fff ffff 0008 cc1d 0000 00fc 0000 0027
0050540  0007 e000 0002 438a 0014 3600 0000 002c 0018 c1c4 b27c b66c 0000 0000 7fff ffff 0007 e7c0 0200 0db5 0200 284d 0000 2c27
0050620  0000 0d7f 0000 315f 0000 002c 0007 e02c b4f0 b4e4 0000 0000 7fff ffff 0008 eb1d 0000 00fc 0000 0028 0007 e058 0002 438a
0050700  0013 fa2c 0000 0028 0019 9338 b27c b66c 0000 0000 7fff ffff 0007 e818 0200 0db5 0100 32b5 0000 2c27 0000 315f 0000 002c
0050760  0000 0000 040a 0408 0000 0000 7fff ffff 0000 0000 0000 0000 0000 0013 0000 002c ffff ffac 0000 0000 0000 0034 0007 d6a8
0051040  b27c b66c 0000 0000 7fff ffff 0007 e0e0 0200 0db5 0400 242d 0000 2c27 0000 0003 0000 2c27 0000 21cf 0000 315f 0000 0034
0051120  0007 e0ac b27c b66c 0000 0000 7fff ffff 0007 e114 0200 0db5 0400 242d 0000 2c37 0000 0003 0000 2c27 0000 21cf 0000 315f
0051200  0000 0034 0007 e0e0 b27c b66c 0000 0000 7fff ffff 0007 e148 0200 0db5 0400 242d 0000 261f 0000 0003 0000 2c27 0000 21cf
0051260  0000 315f 0000 0034 0007 e114 b27c b66c 0000 0000 7fff ffff 0007 e17c 0200 0db5 0400 242d 0000 294f 0000 0013 0000 2c27
0051340  0000 21cf 0000 315f 0000 0034 0007 e148 b27c b66c 0000 0000 7fff ffff 0007 e1b0 0200 0db5 0400 242d 0000 296f 0000 0013
0051420  0000 2c27 0000 21cf 0000 315f 0000 0034 0007 e17c b27c b66c 0000 0000 7fff ffff 0007 e1e4 0200 0db5 0400 242d 0000 2a77
0051500  0000 000b 0000 2c27 0000 21cf 0000 315f 0000 0034 0007 e1b0 b27c b66c 0000 0000 7fff ffff 0007 e218 0200 0db5 0400 242d
0051560  0000 2a77 0000 0013 0000 2c27 0000 21cf 0000 315f 0000 0034 0007 e1e4 b27c b66c 0000 0000 7fff ffff 0007 e24c 0200 0db5
0051640  0400 242d 0000 2e1f 0000 0013 0000 2c27 0000 21cf 0000 315f 0000 0034 0007 e218 b27c b66c 0000 0000 7fff ffff 0007 e280
0051720  0200 0db5 0400 2424 0000 2e1f 0000 001b 0000 2c27 0000 21cf 0000 315f 0000 0034 0007 e24c b27c b66c 0000 0000 7fff ffff
0052000  0007 e2b4 0200 0db5 0400 242d 0000 2e67 0000 0013 0000 2c27 0000 21cf 0000 315f 0000 0034 0007 e280 b27c b66c 0000 0000
0052060  7fff ffff 0007 e2e8 0200 0db5 0400 242d 0000 2e67 0000 001b 0000 2c27 0000 21cf 0000 315f 0000 0034 0007 e2b4 b27c b66c
0052140  0000 0000 7fff ffff 0007 e31c 0200 0db5 0400 242d 0000 23a7 0000 001b 0000 2c27 0000 21cf 0000 315f 0000 0034 0007 e2e8
0052220  b27c b66c 0000 0000 7fff ffff 0007 e350 0200 0db5 0400 242d 0000 23df 0000 001b 0000 2c27 0000 21cf 0000 315f 0000 0034
0052300  0007 e31c b27c b66c 0000 0000 7fff ffff 0007 e384 0200 0db5 0400 242d 0000 2cdf 0000 001b 0000 2c27 0000 21cf 0000 315f
0052360  0000 0034 0007 e350 b27c b66c 0000 0000 7fff ffff 0007 e3b8 0200 0db5 0400 242d 0000 23cf 0000 001b 0000 2c27 0000 21cf
0052440  0000 315f 0000 0034 0007 e384 b27c b66c 0000 0000 7fff ffff 0007 e3ec 0200 0db5 0400 242d 0000 23d7 0000 001b 0000 2c27
0052520  0000 21cf 0000 315f 0000 0034 0007 e3b0 b27c b66c 0000 0000 7fff ffff 0007 e420 0200 0db5 0400 242d 0000 1f47 0000 0013
```

```
0052600  0000 2c27 0000 21cf 0000 315f 0000 0034 0007 e3ec b27c b66c 0000 0000 7fff ffff 0007 e454 0200 0db5 0400 242d 0000 1f4f
0052660  0000 0013 0000 2c27 0000 21cf 0000 315f 0000 0034 0007 e420 b27c b66c 0000 0000 7fff ffff 0007 e488 0200 0db5 0400 242d
0052740  0000 2e37 0000 001b 0000 2c27 0000 21cf 0000 315f 0000 0034 0007 e454 b27c b66c 0000 0000 7fff ffff 0007 e4bc 0200 0db5
0053020  0400 242d 0000 1e17 0000 0003 0000 2c27 0000 21cf 0000 315f 0000 0034 0007 e488 b27c b66c 0000 0000 7fff ffff 0007 e4f0
0053100  0200 0db5 0400 242d 0000 1ec7 0000 0003 0000 2c27 0000 21cf 0000 315f 0000 0034 0007 e4bc b27c b66c 0000 0000 7fff ffff
0053160  0007 e86c 0200 0db5 0400 242d 0000 312f 0000 0013 0000 2c27 0000 21cf 0000 315f 0000 002c 0007 e524 b4f0 b4e4 0000 001b
0053240  7fff ffff 0008 e3bd 0000 0000 0000 0001 000a ab1c 0002 438a 0007 e6f0 0000 002c 0007 e550 b4f0 b4e4 0000 000f 7fff ffff
0053320  000a a985 0000 0000 0000 0001 000a a99c 0002 438a 000a 273c 0000 002c 000a a8f4 b27c b66c 0000 0011 7fff ffff 000a a88c
0053400  0200 0db5 0100 267d 0100 2cb5 0000 2c9f 0000 315f 0000 0030 0007 e5d8 b27c b66c 0000 0012 7fff ffff 000a a574 0200 0db5
0053460  0200 2255 0000 20a7 0100 2cb5 0000 2c8f 0000 315f 0000 0030 0007 e608 b27c b66c 0000 0013 7fff ffff 0007 e5a8 0200 0db5
0053540  0200 2255 0000 20a7 0100 2cb5 0000 2c87 0000 315f 0000 0030 0007 e633 b27c b66c 0000 0014 7fff ffff 0007 e5d8 0200 0db5
0053620  0200 2255 0000 20a7 0100 2cb5 0000 2c7f 0000 315f 0000 0030 0007 e668 b27c b66c 0000 0015 7fff ffff 0007 e608 0200 0db5
0053700  0200 2255 0000 20a7 0100 2cb5 0000 2c6f 0000 315f 0000 0030 0007 e698 b27c b66c 0000 0016 7fff ffff 0007 e638 0200 0db5
0053760  0200 2255 0000 20a7 0100 2cb5 0000 2c67 0000 315f 0000 0030 0007 e6c8 b27c b66c 0000 0017 7fff ffff 0007 e668 0200 0db5
0054040  0200 2255 0000 20a7 0100 2cb5 0000 2c77 0000 315f 0000 0030 000a aa28 b27c b66c 0000 0018 7fff ffff 0007 e698 0200 0db5
0054120  0200 2255 0000 244f 0100 2cb5 0000 2c97 0000 315f 000a ab3c 0000 002c 0000 0000 040a 0408 0000 0000 7fff ffff 0000 0000
0054200  0000 0000 0000 0001 0000 002c ffff fe28 0000 0000 0000 0034 0007 a7c4 b27c b66c 0000 0000 7fff ffff 0007 e934 0200 0db5
0054260  0400 24ad 0000 217f 0000 0013 0000 2c27 0000 217f 0000 315f 0000 0000 0000 0000 0000 0000 0000 0000 0000 0000 0000 0000
0054340  0000 0000 0000 0000 0000 0000 0000 0000 0000 0000 0000 0000 0000 0000 0000 0000 0000 002c 0000 0000 040a 0408 0000 0000
0054420  7fff ffff 0000 0000 0000 0000 0000 0001 0000 002c 0000 0174 0000 0000 0000 002c 0007 e000 b27c b66c 0000 0000 7fff ffff
0054500  0007 e9c0 0200 0db5 0200 284d 0000 217f 0000 043f 0000 315f 0000 002c 0000 0000 040a 0408 0000 0000 7fff ffff 0000 0000
0054560  0000 0000 0000 0001 0000 002c ffff ffa8 0000 0000 0000 0028 0007 e058 b27c b66c 0000 0000 7fff ffff 0007 ea18 0200 0db5
0054640  0100 32b5 0000 217f 0000 315f 0000 002c 0000 0000 040a 0408 0000 0000 7fff ffff 0000 0000 0000 0000 0000 0003 0000 002c
0054720  ffff ffac 0000 0000 0000 0034 0007 e4f0 b27c b66c 0000 0000 7fff ffff 0007 e8a0 0200 0db5 0400 242d 0000 1d67 0000 000b
0055000  0000 217f 0000 21cf 0000 315f 0000 0034 0007 e86c b27c b66c 0000 0000 7fff ffff 0007 e8d4 0200 0db5 0400 242d 0000 217f
0055060  0000 0013 0000 217f 0000 21cf 0000 315f 0000 0034 0007 e8a0 b27c b66c 0000 0000 7fff ffff 0007 ea6c 0200 0db5 0400 242d
0055140  0000 21c7 0000 0013 0000 217f 0000 21cf 0000 315f 0000 002c 0000 0000 040a 0408 0000 0000 7fff ffff 0000 0000 0000 0000
0055220  0000 0001 0000 002c ffff ff38 0000 0000 0000 0034 0007 e728 b27c b66c 0000 0000 7fff ffff 0007 f24c 0200 0db5 0400 24ad
0055300  0000 2917 0000 001b 0000 217f 0000 31c7 0000 315f 0000 0000 0000 0000 0000 0000 0000 0000 0000 0000 0000 0000 0000 0000
0055360  0000 0000 0000 0000 0000 0000 0000 0000 0000 002c 0000 0000 040a 0408 0000 0000 7fff ffff 0000 0000 0000 0000 0000 0001
0055440  0000 002c 0000 00ac 0000 0000 0000 002c 0007 e7c0 b27c b66c 0000 0000 7fff ffff 0007 f080 0200 0db5 0200 284d 0000 31c7
0055520  0000 0d47 0000 315f 0000 002c 0000 0000 040a 0408 0000 0000 7fff ffff 0000 0000 0000 0000 0000 0001 0000 002c ffff ffa8
0055600  0000 0000 0000 0028 0007 e818 b27c b66c 0000 0000 7fff ffff 0007 f0d8 0200 0db5 0100 32b5 0000 31c7 0000 315f 0000 002c
0055660  0000 0000 040a 0408 0000 0000 7fff ffff 0000 0000 0000 0000 0000 001a 0000 002c ffff ffac 0000 0000 0000 0034 0007 e8d4
0055740  b27c b66c 0000 0000 7fff ffff 0007 eaa0 0200 0db5 0400 242d 0000 1eaf 0000 000b 0000 31c7 0000 21cf 0000 315f 0000 0034
0056020  0007 ea6c b27c b66c 0000 0000 7fff ffff 0007 ead4 0200 0db5 0400 242d 0000 1f77 0000 000b 0000 31c7 0000 21cf 0000 315f
0056100  0000 0034 0007 eaa0 b27c b66c 0000 0000 7fff ffff 0007 eb08 0200 0db5 0400 242d 0000 1fd7 0000 000b 0000 31c7 0000 21cf
0056160  0000 315f 0000 0034 0007 ead4 b27c b66c 0000 0000 7fff ffff 0007 eb3c 0200 0db5 0400 242d 0000 1ff7 0000 000b 0000 31c7
0056240  0000 21cf 0000 315f 0000 0034 0007 eb08 b27c b66c 0000 0000 7fff ffff 0007 eb70 0200 0db5 0400 242d 0000 240f 0000 000b
0056320  0000 31c7 0000 21cf 0000 315f 0000 0034 0007 eb3c b27c b66c 0000 0000 7fff ffff 0007 eba4 0200 0db5 0400 242d 0000 2c1f
0056400  0000 000b 0000 31c7 0000 21cf 0000 315f 0000 0034 0007 eb70 b27c b66c 0000 0000 7fff ffff 0007 ebd8 0200 0db5 0400 242d
0056460  0000 2edf 0000 000b 0000 31c7 0000 21cf 0000 315f 0000 0034 0007 eba4 b27c b66c 0000 0000 7fff ffff 0007 ec0c 0200 0db5
0056540  0400 242d 0000 301f 0000 000b 0000 31c7 0000 21cf 0000 315f 0000 0034 0007 ebd8 b27c b66c 0000 0000 7fff ffff 0007 ec40
0056620  0200 0db5 0400 242d 0000 309f 0000 0013 0000 31c7 0000 21cf 0000 315f 0000 0034 0007 ec0c b27c b66c 0000 0000 7fff ffff
0056700  0007 ec74 0200 0db5 0400 242d 0000 28a7 0000 001b 0000 31c7 0000 21cf 0000 315f 0000 0034 0007 ec40 b27c b66c 0000 0000
0056760  7fff ffff 0007 eca3 0200 0db5 0400 242d 0000 28a7 0000 0023 0000 31c7 0000 21cf 0000 315f 0000 0034 0007 ec74 b27c b66c
0057040  0000 0000 7fff ffff 0007 ecdc 0200 0db5 0400 242d 0000 2ecf 0000 001b 0000 31c7 0000 21cf 0000 315f 0000 0034 0007 eca8
0057120  b27c b66c 0000 0000 7fff ffff 0007 ed10 0200 0db5 0400 242d 0000 2ecf 0000 0023 0000 31c7 0000 21cf 0000 315f 0000 0034
0057200  0007 ecdc b27c b66c 0000 0000 7fff ffff 0007 ed44 0200 0db5 0400 242d 0000 28af 0000 001b 0000 31c7 0000 21cf 0000 315f
0057260  0000 0034 0007 ed10 b27c b66c 0000 0000 7fff ffff 0007 ed78 0200 0db5 0400 242d 0000 28b7 0000 002b 0000 31c7 0000 21cf
0057340  0000 315f 0000 0034 0007 ed44 b27c b66c 0000 0000 7fff ffff 0007 edac 0200 0db5 0400 242d 0000 28bf 0000 001b 0000 31c7
0057420  0000 21cf 0000 315f 0000 0034 0007 ed78 b27c b66c 0000 0000 7fff ffff 0007 ede0 0200 0db5 0400 242d 0000 28c7 0000 001b
0057500  0000 31c7 0000 21cf 0000 315f 0000 0034 0007 edac b27c b66c 0000 0000 7fff ffff 0007 ee14 0200 0db5 0400 242d 0000 28cf
0057560  0000 001b 0000 31c7 0000 21cf 0000 315f 0000 0034 0007 ede0 b27c b66c 0000 0000 7fff ffff 0007 ee48 0200 0db5 0400 242d
0057640  0000 28d7 0000 001b 0000 31c7 0000 21cf 0000 315f 0000 0034 0007 ee14 b27c b66c 0000 0000 7fff ffff 0007 ee7c 0200 0db5
```

```
0057720 0400 242d 0000 28df 0000 001b 0000 31c7 0000 21cf 0000 315f 0000 0034 0007 ee48 b27c b66c 0000 0000 7fff ffff 0007 eeb0
0060000 0200 0db5 0400 242d 0000 28e7 0000 001b 0000 31c7 0000 21cf 0000 315f 0000 0034 0007 ee7c b27c b66c 0000 0000 7fff ffff
0060060 0007 eee4 0200 0db5 0400 242d 0000 28ef 0000 001b 0000 31c7 0000 21cf 0000 315f 0000 0034 0007 eeb0 b27c b66c 0000 0000
0060140 7fff ffff 0007 ef18 0200 0db5 0400 242d 0000 28f7 0000 001b 0000 31c7 0000 21cf 0000 315f 0000 0034 0007 eee4 b27c b66c
0060220 0000 0000 7fff ffff 0007 ef4c 0200 0db5 0400 242d 0000 28ff 0000 001b 0000 31c7 0000 21cf 0000 315f 0000 0034 0007 ef18
0060300 b27c b66c 0000 0000 7fff ffff 0007 ef80 0200 0db5 0400 242d 0000 2907 0000 0023 0000 31c7 0000 21cf 0000 315f 0000 0034
0060360 0007 ef4c b27c b66c 0000 0000 7fff ffff 0007 efb4 0200 0db5 0400 242d 0000 290f 0000 001b 0000 31c7 0000 21cf 0000 315f
0060440 0000 0034 0007 ef80 b27c b66c 0000 0000 7fff ffff 0007 efe8 0200 0db5 0400 242d 0000 2917 0000 001b 0000 31c7 0000 21cf
0060520 0000 315f 0000 0034 0007 efb4 b27c b66c 0000 0000 7fff ffff 0007 f12c 0200 0db5 0400 242d 0000 291f 0000 001b 0000 31c7
0060600 0000 21cf 0000 315f 0000 0000 0000 0000 0000 0000 0000 0000 0000 0000 0000 0000 0000 0000 0000 0000 0000 0000 0000 0000
0060660 0000 0000 0000 0000 0000 0000 0000 0000 0000 002c 0000 0000 040a 0408 0000 0000 7fff ffff 0000 0000 0000 0000 0000 0001
0060740 0000 002c 0000 0260 0000 0000 0000 002c 0007 e9c0 b27c b66c 0000 0000 7fff ffff 0007 f340 0200 0db5 0200 284d 0000 255f
0061020 0000 0d67 0000 315f 0000 002c 0000 0000 040a 0408 0000 0000 7fff ffff 0000 0000 0000 0000 0000 0001 0000 002c ffff ffa8
0061100 0000 0000 0000 0028 0007 ea18 b27c b66c 0000 0000 7fff ffff 0007 f398 0200 0db5 0100 32b5 0000 255f 0000 315f 0000 002c
0061160 0000 0000 040a 0408 0000 0000 7fff ffff 0000 0000 0000 0000 0000 0002 0000 002c ffff ffac 0000 0000 0000 0034 0007 efe8
0061240 b27c b66c 0000 0000 7fff ffff 0007 f160 0200 0db5 0400 242d 0000 255f 0000 000b 0000 255f 0000 21cf 0000 315f 0000 0034
0061320 0007 f12c b27c b66c 0000 0000 7fff ffff 0007 f3ec 0200 0db5 0400 242d 0000 2bdf 0000 000b 0000 255f 0000 21cf 0000 315f
0061400 0000 002c 0000 0000 040a 0408 0000 0000 7fff ffff 0000 0000 0000 0000 0000 0002 0000 002c ffff ff6c 0000 0000 0000 0030
0061460 0007 de78 b27c b66c 0000 0000 7fff ffff 0007 f1f0 0200 0db5 0200 2855 0100 255d 0000 0daf 0000 255f 0000 315f 0000 0030
0061540 0007 f1c0 b27c b66c 0000 0000 7fff ffff 0007 f5b8 0200 0db5 0200 2855 0100 2bdd 0000 0daf 0000 255f 0000 315f 0000 002c
0061620 0000 0000 040a 0408 0000 0000 7fff ffff 0000 0000 0000 0000 0000 0002 0000 002c ffff ff74 0000 0000 0000 0034 0007 e934
0061700 b27c b66c 0000 0000 7fff ffff 0007 f280 0200 0db5 0400 24ad 0000 2fe7 0000 0023 0000 255f 0000 1ea7 0000 315f 0000 0034
0061760 0007 f24c b27c b66c 0000 0000 7fff ffff 0007 f930 0200 0db5 0400 24ad 0000 1ea7 0000 001b 0000 255f 0000 1ea7 0000 315f
0062040 0000 002c 0000 0000 040a 0408 0000 0000 7fff ffff 0000 0000 0000 0000 0000 0001 0000 002c ffff ff6c 0000 0000 0000 002c
0062120 0007 df84 b27c b66c 0000 0000 7fff ffff 0007 f9c4 0200 0db5 0200 24bd 0000 255f 0000 2c27 0000 315f 0000 0000 0000 0000
0062200 0000 002c 0000 0000 040a 0408 0000 0000 7fff ffff 0000 0000 0000 0000 0000 0001 0000 002c 0000 0278 0000 0000 0000 002c
0062260 0007 f080 b27c b66c 0000 0000 7fff ffff 0007 f7c0 0200 0db5 0200 2841 0000 1ea7 0000 0d37 0000 315f 0000 002c 0000 0000
0062340 040a 0408 0000 0000 7fff ffff 0000 0000 0000 0000 0000 0001 0000 002c ffff ffa8 0000 0000 0000 0028 0007 f0d8 b27c b66c
0062420 0000 0000 7fff ffff 0007 f818 0200 0db5 0100 32b5 0000 1ea7 0000 315f 0000 002c 0000 0000 040a 0408 0000 0000 7fff ffff
0062500 0000 0000 0000 0000 0000 0003 0000 002c ffff ffac 0000 0000 0000 0034 0007 f160 b27c b66c 0000 0000 7fff ffff 0007 f420
0062560 0200 0db5 0400 242d 0000 1d37 0000 0013 0000 1ea7 0000 21cf 0000 315f 0000 0034 0007 f3ec b27c b66c 0000 0000 7fff ffff
0062640 0007 f454 0200 0db5 0400 242d 0000 1ea7 0000 0013 0000 1ea7 0000 21cf 0000 315f 0000 0034 0007 f420 b27c b66c 0000 0000
0062720 7fff ffff 0007 f488 0200 0db5 0400 242d 0000 1ea7 0000 001b 0000 1ea7 0000 21cf 0000 315f 0000 0034 0007 f454 b27c b66c
0063000 0000 0000 7fff ffff 0007 f4bc 0200 0db5 0400 242d 0000 1ea7 0000 0023 0000 1ea7 0000 21cf 0000 315f 0000 0034 0007 f488
0063060 b27c b66c 0000 0000 7fff ffff 0007 f4f0 0200 0db5 0400 242d 0000 1ea7 0000 002b 0000 1ea7 0000 21cf 0000 315f 0000 0034
0063140 0007 f4bc b27c b66c 0000 0000 7fff ffff 0007 f524 0200 0db5 0400 242d 0000 1ea7 0000 0033 0000 1ea7 0000 21cf 0000 315f
0063220 0000 0034 0007 f4f0 b27c b66c 0000 0000 7fff ffff 0007 f558 0200 0db5 0400 242d 0000 1ea7 0000 003b 0000 1ea7 0000 21cf
0063300 0000 315f 0000 0034 0007 f524 b27c b66c 0000 0000 7fff ffff 0007 f86c 0200 0db5 0400 242d 0000 2fe7 0000 0023 0000 1ea7
0063360 0000 21cf 0000 315f 0000 002c 0000 0000 040a 0408 0000 0000 7fff ffff 0000 0000 0000 0000 0000 0007 0000 002c ffff fe34
0063440 0000 0000 0000 0034 0007 f1f0 b27c b66c 0000 0000 7fff ffff 0007 f5ec 0200 0db5 0200 2855 0200 1d35 0000 0daf 0000 0ab7
0063520 0000 1ea7 0000 315f 0000 0034 0007 f5b8 b27c b66c 0000 0000 7fff ffff 0007 f620 0200 0db5 0200 2855 0200 1ea5 0000 000b
0063600 0000 0e3f 0000 1ea7 0000 315f 0000 0038 0007 f5ec b27c b66c 0000 0000 7fff ffff 0007 f658 0200 0db5 0200 2855 0300 1ea5
0063660 0000 0013 0000 0e3f 0000 0e3f 0000 1ea7 0000 315f 0000 003c 0007 f620 b27c b66c 0000 0000 7fff ffff 0007 f694 0200 0db5
0063740 0200 2855 0400 1ea5 0000 001b 0000 0e3f 0000 0e3f 0000 0e3f 0000 1ea7 0000 315f 0000 0040 0007 f658 b27c b66c 0000 0000
0064020 7fff ffff 0007 f6d4 0200 0db5 0200 2855 0500 1ea5 0000 0023 0000 0e3f 0000 0e3f 0000 0e3f 0000 0e3f 0000 1ea7 0000 315f
0064100 0000 0044 0007 f694 b27c b66c 0000 0000 7fff ffff 0007 f718 0200 0db5 0200 2855 0600 1ea5 0000 002b 0000 0e3f 0000 0e3f
0064160 0000 0e3f 0000 0e3f 0000 0e3f 0000 1ea7 0000 315f 0000 0048 0007 f6d4 b27c b66c 0000 0000 7fff ffff 0007 f8cc 0200 0db5
0064240 0200 2855 0700 1ea5 0000 0033 0000 0e3f 0000 0e3f 0000 0e3f 0000 0e3f 0000 0e3f 0000 0e3f 0000 1ea7 0000 315f 0000 0000
0064320 0000 0000 0000 0000 0000 0000 0000 0000 0000 0000 0000 0000 0000 0000 0000 0000 0000 0000 0000 0000 0000 0000 0000 0000
0064400 0000 002c 0000 0000 040a 0408 0000 0000 7fff ffff 0000 0000 0000 0000 0000 0001 0000 002c 0000 0204 0000 0000 0000 002c
0064460 0007 f340 b27c b66c 0000 0000 7fff ffff 0007 fa80 0200 0db5 0200 284d 0000 20cf 0000 0d5f 0000 315f 0000 002c 0000 0000
0064540 040a 0408 0000 0000 7fff ffff 0000 0000 0000 0000 0000 0001 0000 002c ffff ffa8 0000 0000 0000 0028 0007 f398 b27c b66c
0064620 0000 0000 7fff ffff 0007 fad8 0200 0db5 0100 32b5 0000 20cf 0000 315f 0000 002c 0000 0000 040a 0408 0000 0000 7fff ffff
0064700 0000 0000 0000 0000 0000 0001 0000 002c ffff ffac 0000 0000 0000 0034 0007 f558 b27c b66c 0000 0000 7fff ffff 0007 fb2c
0064760 0200 0db5 0400 242d 0000 295f 0000 001b 0000 20cf 0000 21cf 0000 315f 0000 002c 0000 0000 040a 0408 0000 0000 7fff ffff
```

| | | | | | | | | | | | | | | | | | | | | | | | | |
|---|---|---|---|---|---|---|---|---|---|---|---|---|---|---|---|---|---|---|---|---|---|---|---|---|
| 0065040 | 0000 | 0000 | 0000 | 0000 | 0000 | 0001 | 0000 | 002c | ffff | ffa0 | 0000 | 0000 | 0000 | 0038 | 0007 | f718 | b27c | b66c | 0000 | 0000 | 7fff | ffff | 0008 | 0374 |
| 0065120 | 0200 | 0db5 | 0200 | 2955 | 0300 | 295d | 0000 | 0e3f | 0000 | 0ab7 | 0000 | 0023 | 0000 | 20cf | 0000 | 315f | 0000 | 002c | 0000 | 0000 | 040a | 0408 | 0000 | 0000 |
| 0065200 | 7fff | ffff | 0000 | 0000 | 0000 | 0000 | 0000 | 0002 | 0000 | 002c | ffff | ff9c | 0000 | 0000 | 0000 | 0034 | 0007 | f280 | b27c | b66c | 0000 | 0000 | 7fff | ffff |
| 0065260 | 0007 | f964 | 0200 | 0db5 | 0400 | 24ad | 0000 | 1ea7 | 0000 | 002b | 0000 | 20cf | 0000 | 1ea7 | 0000 | 315f | 0000 | 0034 | 0007 | f930 | b27c | b66c | 0000 | 0000 |
| 0065340 | 7fff | ffff | 000b | 688c | 0200 | 0db5 | 0400 | 24ad | 0000 | 2fe7 | 0000 | 0023 | 0000 | 20cf | 0000 | 1ea7 | 0000 | 315f | 0000 | 002c | 0000 | 0000 | 040a | 0408 |
| 0065420 | 0000 | 0000 | 7fff | ffff | 0000 | 0000 | 0000 | 0000 | 0000 | 0001 | 0000 | 002c | ffff | ff6c | 0000 | 0000 | 0000 | 002c | 0007 | f2e0 | b27c | b66c | 0000 | 0000 |
| 0065500 | 7fff | ffff | 0007 | f9f0 | 0200 | 0db5 | 0200 | 24bd | 0000 | 20cf | 0000 | 2c27 | 0000 | 315f | 0000 | 002c | 0007 | f9c4 | b27c | b66c | 0000 | 0000 | 7fff | ffff |
| 0065560 | 0007 | fdfc | 0200 | 0db5 | 0200 | 24bd | 0000 | 20cf | 0000 | 27c7 | 0000 | 315f | 0000 | 0000 | 0000 | 0000 | 0000 | 0000 | 0000 | 0000 | 0000 | 0000 | 0000 | 0000 |
| 0065640 | 0000 | 0000 | 0000 | 0000 | 0000 | 0000 | 0000 | 0000 | 0000 | 0000 | 0000 | 0000 | 0000 | 0000 | 0000 | 0000 | 0000 | 002c | 0000 | 0000 | 040a | 0408 | 0000 | 0000 |
| 0065720 | 7fff | ffff | 0000 | 0000 | 0000 | 0000 | 0000 | 0001 | 0000 | 002c | 0000 | 037c | 0000 | 0000 | 0000 | 002c | 0007 | f7c0 | b27c | b66c | 0000 | 0000 | 7fff | ffff |
| 0066000 | 0007 | fec0 | 0200 | 0db5 | 0200 | 284d | 0000 | 27c7 | 0000 | 0377 | 0000 | 315f | 0000 | 002c | 0000 | 0000 | 040a | 0408 | 0000 | 0000 | 7fff | ffff | c000 | 0000 |
| 0066060 | 0000 | 0000 | 0000 | 0001 | 0000 | 002c | ffff | ffa8 | 0000 | 0000 | 0000 | 0028 | 0007 | f818 | b27c | b66c | 0000 | 0000 | 7fff | ffff | 0007 | ff18 | 0200 | 0db5 |
| 0066140 | 0100 | 32b5 | 0000 | 27c7 | 0000 | 315f | 0000 | 002c | 0000 | 0000 | 040a | 0408 | 0000 | 0000 | 7fff | ffff | 0000 | 0000 | 0000 | 0000 | 0000 | 0009 | 0000 | 002c |
| 0066220 | ffff | ffac | 0000 | 0000 | 0000 | 0034 | 0007 | f85c | b27c | b66c | 0000 | 0000 | 7fff | ffff | 0007 | fb60 | 0200 | 0db5 | 0400 | 242d | 0000 | 2e57 | 0000 | 0013 |
| 0066300 | 0000 | 27c7 | 0000 | 21cf | 0000 | 315f | 0000 | 0034 | 0007 | fb2c | b27c | b66c | 0000 | 0000 | 7fff | ffff | 0007 | fb94 | 0200 | 0db5 | 0400 | 242d | 0000 | 2e57 |
| 0066360 | 0000 | 001b | 0000 | 27c7 | 0000 | 21cf | 0000 | 315f | 0000 | 0034 | 0007 | fb60 | b27c | b66c | 0000 | 0000 | 7fff | ffff | 0007 | fbc8 | 0200 | 0db5 | 0400 | 242d |
| 0066440 | 0000 | 2e77 | 0000 | 0013 | 0000 | 27c7 | 0000 | 21cf | 0000 | 315f | 0000 | 0034 | 0007 | fb94 | b27c | b66c | 0000 | 0000 | 7fff | ffff | 0007 | fbfc | 0200 | 0db5 |
| 0066520 | 0400 | 242d | 0000 | 2e77 | 0000 | 001b | 0000 | 27c7 | 0000 | 21cf | 0000 | 315f | 0000 | 0034 | 0007 | fbc8 | b27c | b66c | 0000 | 0000 | 7fff | ffff | 0007 | fc30 |
| 0066600 | 0200 | 0db5 | 0400 | 242d | 0000 | 2e2f | 0000 | 0013 | 0000 | 27c7 | 0000 | 21cf | 0000 | 315f | 0000 | 0034 | 0007 | fbfc | b27c | b66c | 0000 | 0000 | 7fff | ffff |
| 0066660 | 0007 | fc64 | 0200 | 0db5 | 0400 | 242d | 0000 | 2e2f | 0000 | 001b | 0000 | 27c7 | 0000 | 21cf | 0000 | 315f | 0000 | 0034 | 0007 | fc30 | b27c | b66c | 0000 | 0000 |
| 0066740 | 7fff | ffff | 0007 | fc98 | 0200 | 0db5 | 0400 | 242d | 0000 | 2e6f | 0000 | 0013 | 0000 | 27c7 | 0000 | 21cf | 0000 | 315f | 0000 | 0034 | 0007 | fc64 | b27c | b66c |
| 0067020 | 0000 | 0000 | 7fff | ffff | 0007 | fccc | 0200 | 0db5 | 0400 | 242d | 0000 | 2e6f | 0000 | 001b | 0000 | 27c7 | 0000 | 21cf | 0000 | 315f | 0000 | 0034 | 0007 | fc98 |
| 0067100 | b27c | b66c | 0000 | 0000 | 7fff | ffff | 0007 | fd00 | 0200 | 0db5 | 0400 | 242d | 0000 | 296f | 0000 | 001b | 0000 | 27c7 | 0000 | 21cf | 0000 | 315f | 0000 | 0034 |
| 0067160 | 0007 | fccc | b27c | b66c | 0000 | 0000 | 7fff | ffff | 0007 | fd34 | 0200 | 0db5 | 0400 | 242d | 0000 | 2957 | 0000 | 001b | 0000 | 27c7 | 0000 | 21cf | 0000 | 315f |
| 0067240 | 0000 | 0034 | 0007 | fd00 | b27c | b66c | 0000 | 0000 | 7fff | ffff | 0007 | fd68 | 0200 | 0db5 | 0400 | 242d | 0000 | 2977 | 0000 | 001b | 0000 | 27c7 | 0000 | 21cf |
| 0067320 | 0000 | 315f | 0000 | 0034 | 0007 | fd34 | b27c | b66c | 0000 | 0000 | 7fff | ffff | 0007 | fd9c | 0200 | 0db5 | 0400 | 242d | 0000 | 2cef | 0000 | 001b | 0000 | 27c7 |
| 0067400 | 0000 | 21cf | 0000 | 315f | 0000 | 0034 | 0007 | fd68 | b27c | b66c | 0000 | 0000 | 7fff | ffff | 0007 | ff6c | 0200 | 0db5 | 0400 | 242d | 0000 | 294f | 0000 | 001b |
| 0067460 | 0000 | 27c7 | 0000 | 21cf | 0000 | 315f | 0000 | 002c | 0000 | 0000 | 040a | 0408 | 0000 | 0000 | 7fff | ffff | 0000 | 0000 | 0000 | 0000 | 0000 | 0001 | 0000 | 002c |
| 0067540 | ffff | fd30 | 0000 | 0000 | 0000 | 002c | 0007 | f9f0 | b27c | b66c | 0000 | 0000 | 7fff | ffff | 0007 | fe28 | 0200 | 0db5 | 0200 | 24bd | 0000 | 27c7 | 0000 | 2c27 |
| 0067620 | 0000 | 315f | 0000 | 002c | 0007 | fdfc | b27c | b66c | 0000 | 0000 | 7fff | ffff | 0008 | 0478 | 0200 | 0db5 | 0200 | 24bd | 0000 | 27c7 | 0000 | 1dff | 0000 | 315f |
| 0067700 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 |
| 0067760 | 0000 | 0000 | 0000 | 0000 | 0000 | 0000 | 0000 | 0000 | 0000 | 002c | 0000 | 0000 | 040a | 0408 | 0000 | 0000 | 7fff | ffff | 0000 | 0000 | 0000 | 0000 | 0000 | 0001 |
| 0070040 | 0000 | 002c | 0000 | 05b8 | 0000 | 0000 | 0000 | 002c | 0007 | f180 | b27c | b66c | 0000 | 0000 | 7fff | ffff | 000a | d410 | 0200 | 0db5 | 0200 | 284d | 0000 | 1dff |
| 0070120 | 0000 | 0d57 | 0000 | 315f | 0000 | 002c | 0000 | 0000 | 040a | 0408 | 0000 | 0000 | 7fff | ffff | 0000 | 0000 | 0000 | 0000 | 0000 | 0001 | 0000 | 002c | ffff | ffa8 |
| 0070200 | 0000 | 0000 | 0000 | 0028 | 0007 | fad8 | b27c | b66c | 0000 | 0000 | 7fff | ffff | 000a | a4fc | 0200 | 0db5 | 0100 | 32b5 | 0000 | 1dff | 0000 | 315f | 0000 | 002c |
| 0070260 | 0000 | 0000 | 040a | 0408 | 0000 | 0000 | 7fff | ffff | 0000 | 0000 | 0000 | 0000 | 0000 | 0008 | 0000 | 002c | ffff | ffac | 0000 | 0000 | 0000 | 0034 | 0007 | fd9c |
| 0070340 | b27c | b66c | 0000 | 0000 | 7fff | ffff | 0007 | ffa0 | 0200 | 0db5 | 0400 | 242d | 0000 | 1dff | 0000 | 000b | 0000 | 1dff | 0000 | 21cf | 0000 | 315f | 0000 | 0034 |
| 0070420 | 0007 | ff6c | b27c | b66c | 0000 | 0000 | 7fff | ffff | 0007 | ffd4 | 0200 | 0db5 | 0400 | 242d | 0000 | 1dff | 0000 | 0013 | 0000 | 1dff | 0000 | 21cf | 0000 | 315f |
| 0070500 | 0000 | 0034 | 0007 | ffa0 | b27c | b66c | 0000 | 0000 | 7fff | ffff | 0008 | 0008 | 0200 | 0db5 | 0400 | 242d | 0000 | 1dff | 0000 | 001b | 0000 | 1dff | 0000 | 21cf |
| 0070560 | 0000 | 315f | 0000 | 0034 | 0007 | ffd4 | b27c | b66c | 0000 | 0000 | 7fff | ffff | 0008 | 003c | 0200 | 0db5 | 0400 | 242d | 0000 | 1dff | 0000 | 0023 | 0000 | 1dff |
| 0070640 | 0000 | 21cf | 0000 | 315f | 0000 | 0034 | 0008 | 0008 | b27c | b66c | 0000 | 0000 | 7fff | ffff | 0008 | 0070 | 0200 | 0db5 | 0400 | 242d | 0000 | 1df7 | 0000 | 000b |
| 0070720 | 0000 | 1dff | 0000 | 21cf | 0000 | 315f | 0000 | 0034 | 0008 | 003c | b27c | b66c | 0000 | 0000 | 7fff | ffff | 0008 | 00a4 | 0200 | 0db5 | 0400 | 242d | 0000 | 1df7 |
| 0071000 | 0000 | 0013 | 0000 | 1dff | 0000 | 21cf | 0000 | 315f | 0000 | 0034 | 0008 | 0070 | b27c | b66c | 0000 | 0000 | 7fff | ffff | 0008 | 00d8 | 0200 | 0db5 | 0400 | 242d |
| 0071060 | 0000 | 1df7 | 0000 | 001b | 0000 | 1dff | 0000 | 21cf | 0000 | 315f | 0000 | 0034 | 0008 | 00a4 | b27c | b66c | 0000 | 0000 | 7fff | ffff | 0008 | 010c | 0200 | 0db5 |
| 0071140 | 0400 | 242d | 0000 | 1df7 | 0000 | 0023 | 0000 | 1dff | 0000 | 21cf | 0000 | 315f | 0000 | 0034 | 0008 | 00d8 | b27c | b66c | 0000 | 0000 | 7fff | ffff | 0008 | 0140 |
| 0071220 | 0200 | 0db5 | 0400 | 242d | 0000 | 1e07 | 0000 | 000b | 0000 | 1dff | 0000 | 21cf | 0000 | 315f | 0000 | 0034 | 0008 | 010c | b27c | b66c | 0000 | 0000 | 7fff | ffff |
| 0071300 | 0008 | 0174 | 0200 | 0db5 | 0400 | 242d | 0000 | 1e07 | 0000 | 0013 | 0000 | 1dff | 0000 | 21cf | 0000 | 315f | 0000 | 0034 | 0008 | 0140 | b27c | b66c | 0000 | 0000 |
| 0071360 | 7fff | ffff | 0008 | 01a8 | 0200 | 0db5 | 0400 | 242d | 0000 | 1e07 | 0000 | 001b | 0000 | 1dff | 0000 | 21cf | 0000 | 315f | 0000 | 0034 | 0008 | 0174 | b27c | b66c |
| 0071440 | 0000 | 0000 | 7fff | ffff | 0008 | 01dc | 0200 | 0db5 | 0400 | 242d | 0000 | 1e07 | 0000 | 0023 | 0000 | 1dff | 0000 | 21cf | 0000 | 315f | 0000 | 0034 | 0008 | 01a8 |
| 0071520 | b27c | b66c | 0000 | 0000 | 7fff | ffff | 0008 | 0210 | 0200 | 0db5 | 0400 | 242d | 0000 | 2e5f | 0000 | 0013 | 0000 | 1dff | 0000 | 21cf | 0000 | 315f | 0000 | 0034 |
| 0071600 | 0008 | 01dc | b27c | b66c | 0000 | 0000 | 7fff | ffff | 0008 | 0244 | 0200 | 0db5 | 0400 | 242d | 0000 | 3057 | 0000 | 001b | 0000 | 1dff | 0000 | 21cf | 0000 | 315f |
| 0071660 | 0000 | 0034 | 0008 | 0210 | b27c | b66c | 0000 | 0000 | 7fff | ffff | 0008 | 0278 | 0200 | 0db5 | 0400 | 242d | 0000 | 3057 | 0000 | 0023 | 0000 | 1dff | 0000 | 21cf |
| 0071740 | 0000 | 315f | 0000 | 0034 | 0008 | 0244 | b27c | b66c | 0000 | 0000 | 7fff | ffff | 0008 | 02ac | 0200 | 0db5 | 0400 | 242d | 0000 | 305f | 0000 | 0023 | 0000 | 1dff |
| 0072020 | 0000 | 21cf | 0000 | 315f | 0000 | 0034 | 0008 | 0278 | b27c | b66c | 0000 | 0000 | 7fff | ffff | 0008 | 02e0 | 0200 | 0db5 | 0400 | 242d | 0000 | 3007 | 0000 | 000b |
| 0072100 | 0000 | 1dff | 0000 | 21cf | 0000 | 315f | 0000 | 0034 | 0008 | 02ac | b27c | b66c | 0000 | 0000 | 7fff | ffff | 0008 | 0314 | 0200 | 0db5 | 0400 | 242d | 0000 | 3007 |

```
0072160  0000 0013 0000 1dff 0000 21cf 0000 315f 0000 0034 0008 02e0 b27c b66c 0000 0000 7fff ffff 000a d47c 0200 0db5 0400 242d
0072240  0000 300f 0000 0013 0000 1dff 0000 21cf 0000 315f 0000 002c b27c 0000 0000 040a 0408 0000 0000 7fff ffff 0000 0000 0000 0000
0072320  0000 0004 0000 002c ffff fbf8 0000 0000 0000 0030 0007 f8cc b27c b66c 0000 0000 7fff ffff 0008 03a4 0200 0db5 0200 2855
0072400  0100 1dfd 0000 0daf 0000 1dff 0000 315f 0000 0034 c008 0374 b27c b66c 0000 0000 7fff ffff 0008 03d8 0200 0db5 0200 2855
0072460  0200 1dfd 0000 0daf 0000 0ab7 0000 1dff 0000 315f 0000 003a 0008 03a4 b27c b66c 0000 0300 7fff ffff 0008 0410 0200 0db5
0072540  0200 2855 0300 1dfd 0000 0daf 0000 0ad7 0000 0ad7 0000 1dff 0000 315f 0000 003c 0008 03d8 b27c b66c 0000 0000 7fff ffff
0072620  000a e43c 0200 0db5 0200 2855 0400 1dfd 0000 0daf 0000 0ab7 0000 0ad7 0000 0ad7 0000 1dff 0000 315f 0000 002c 0000 0000
0072700  040a 0408 0000 0000 7fff ffff 0000 0000 0000 0000 0000 0001 0000 002c ffff fefc 0000 0000 0000 002c 0007 fe28 b27c b66c
0072760  0000 0000 7fff ffff 000b 166c 0200 0db5 0200 24bd 0000 1dff 0000 2c27 0000 315f 0000 0000 0000 0000 0000 0000 0000 0000
0073040  0000 0000 0000 0000 0000 0000 0000 0000 0000 0000 0000 0000 0000 0008 aa6c ffff ffff 0000 0017 0000 001f 0000 0000
0073120  0004 96d0 0004 96d0 0081 002a 0000 0000 0008 04cc 0000 0017 0000 001f 0000 0000 0005 772c 0005 7770 0081 0035 0000 0000
0073200  0008 04ec 0000 0017 0000 001f 0000 0000 0003 286c 0003 286c 0081 0010 0000 0000 0008 050c 0000 0017 0000 0027 0000 0000
0073260  0004 93ec 0004 9434 0081 0029 0000 0000 0008 052c 0000 0017 0000 001f 0000 0000 0005 7864 0005 7864 0081 0035 0000 0000
0073340  0008 054c 0000 0017 0000 001f 0000 0000 0005 7844 0005 7858 0081 0035 0000 0000 0008 056c 0000 0017 0000 0027 0000 0000
0073420  0004 9450 0004 94b4 0081 0029 0000 0000 0008 058c 0000 0017 0000 001f 0000 0000 0004 0108 0004 0108 0081 001e 0000 0000
0073500  0008 05ac 0000 0017 0000 001f 0000 0000 0003 fab8 0003 fab8 0081 001e 0000 0000 0008 05cc 0000 0017 0000 001f 0000 0000
0073560  0003 fdf0 0003 f4f0 0081 001e 0000 0000 0008 05ec 0000 0017 0000 001f 0000 0000 0004 120c 0004 120c 0081 0023 0000 0000
0073640  0008 060c 0000 0017 0000 001f 0000 0000 0004 9fa0 0004 9fa0 0081 002a 0000 0000 0008 062c 0000 0017 0000 001f 0000 0000
0073720  0005 8664 0005 8664 0081 0035 0000 0000 0008 064c 0000 0017 0000 001f 0000 0000 0004 9660 0004 96b8 0081 002a 0000 0000
0074000  0008 066c 0000 0017 0000 001f 0000 0000 0005 a014 0005 a014 0081 0039 0000 0000 0008 068c 0000 0017 0000 001f 0000 0000
0074060  0004 9814 0004 99e4 0081 002a 0000 0000 0008 06ac 0000 0017 0000 001f 0000 0000 0003 f904 0003 f904 0081 001e 0000 0000
0074140  0008 06cc 0000 0017 0000 001f 0000 0000 0002 6d20 0002 6d20 0081 0003 0000 0000 0008 06ec 0000 0017 0000 001f 0000 0000
0074220  0003 c0d0 0003 c0d0 00a1 0018 0000 0000 0008 070c 0000 0017 0000 001f 0000 0000 0003 6374 0003 63a0 0081 0012 0000 0000
0074300  0008 072c 0000 0017 0000 001f 0000 0000 0004 9f78 0004 9f94 0081 002a 0000 0000 0008 074c 0000 0017 0000 001f 0000 0000
0074360  0002 6cf0 0002 6cf0 0081 0003 0000 0000 0008 076c 0000 0017 0000 001f 0000 0000 0003 3050 0003 307c 0081 0010 0000 0000
0074440  0008 078c 0000 0017 0000 001f 0000 0000 0003 cb14 0003 cb14 00a1 0018 0000 0000 0008 07ac 0000 0017 0000 001f 0000 0000
0074520  0003 f8c8 0003 f8c8 0081 001e 0000 0000 0008 07cc 0000 0017 0000 001f 0000 0000 0003 f80c 0003 f80c 0081 001e 0000 0000
0074600  0008 07ec 0000 0017 0000 001f 0000 0000 0003 f8a4 0003 f8bc 0081 001e 0000 0000 0008 080c 0000 0017 0000 001f 0000 0000
0074660  0003 f948 0003 f948 0081 001e 0000 0000 0008 082c 0000 0017 0000 002f 0000 0000 0005 8bac 0005 8bac 0081 0037 0000 0000
0074740  0008 084c 0000 0017 0000 001f 0000 0000 0003 f964 0003 f964 0081 001e 0000 0000 0008 086c 0000 0017 0000 001f 0000 0000
0075020  0003 f924 0003 f924 0081 001e 0000 0000 0008 088c 0000 0017 0000 001f 0000 0000 0003 f8e4 0003 f8e4 0081 001e 0000 0000
0075100  0008 08ac 0000 0017 0000 001f 0000 0000 0002 81cc 0002 81cc 0081 0008 0000 0000 0008 08cc 0000 0017 0000 001f 0000 0000
0075160  0003 c164 0003 c164 00a1 0018 0000 0000 0008 08ec 0000 0017 0000 0027 0000 0000 0004 5dcc 0004 5dcc 0081 0029 0000 0000
0075240  0008 090c 0000 0017 0000 001f 0000 0000 0004 135c 0004 135c 0081 0023 0000 0000 0008 092c 0000 0017 0000 001f 0000 0000
0075320  0005 7a44 0005 7a44 0081 0035 0000 0000 0008 094c 0000 0017 0000 001f 0000 0000 0003 3e04 0003 3e04 0081 0011 0000 0000
0075400  0008 096c 0000 0017 0000 001f 0000 0000 0005 7610 0005 7610 0081 0035 0000 0000 0008 098c 0000 0017 0000 001f 0000 0000
0075460  0005 792c 0005 7978 0081 0035 0000 0000 0008 09ac 0000 0017 0000 001f 0000 0000 0002 8208 0002 8208 0081 0008 0000 0000
0075540  0008 09cc 0000 0017 0000 001f 0000 0000 0003 2004 0003 2040 0081 0010 0000 0000 0008 09ec 0000 0017 0000 001f 0000 0000
0075620  0003 67a4 0003 6744 0081 0012 0000 0000 0008 0a0c 0000 0017 0000 001f 0000 0000 0003 c754 0003 c754 00a1 0018 0000 0000
0075700  0008 0a2c 0000 0017 0000 001f 0000 0000 0002 60c0 0002 60cc 0081 0003 0000 0000 0008 0a4c 0000 0017 0000 001f 0000 0000
0075760  0002 6e1c 0002 6e1c 0081 0003 0000 0000 0008 0a6c 0000 0017 0000 001f 0000 0000 0003 5ba0 0003 5bc0 0081 0012 0000 0000
0076040  0008 0a8c 0000 0017 0000 001f 0000 0000 0004 9f38 0004 9f38 0081 002a 0000 0000 0008 0aac 0000 0017 0000 0027 0000 0000
0076120  0004 84b0 0004 84d0 0081 0029 0000 0000 0008 0acc 0000 0017 0000 001f 0000 0000 0003 f510 0003 f510 0081 001c 0000 0000
0076200  0008 0aec 0000 0017 0000 001f 0000 0000 0003 66b0 0003 66b0 0081 0012 0000 0000 0008 0b0c 0100 0017 0000 001f 0000 0004
0076260  0003 cae0 0003 cae0 00a1 0018 0000 0000 0008 0b2c 0100 0017 0000 0027 0000 0004 0004 6e04 0004 6e04 0081 0029 0000 0000
0076340  0008 0b4c 0100 0017 0000 001f 0000 0004 0004 43d4 0004 4428 0081 0027 0000 0000 0008 0b6c 0100 0017 0000 001f 0000 0004
0076420  0004 9a68 0004 9a90 0081 002a 0000 0000 0008 0b8c 0100 0017 0000 0037 0000 0004 0002 f534 0002 f534 0081 000d 0000 0000
0076500  0008 0bac 0100 0017 0000 001f 0000 0004 0003 c088 0003 c088 00a1 0018 0000 0000 0008 0bcc 0100 0017 0000 001f 0000 0004
0076560  0003 c070 0003 c070 00a1 0018 0000 0000 0008 0bec 0100 0017 0000 001f 0000 0004 0003 74f8 0003 7514 0081 0014 0000 0000
0076640  0008 0c0c 0100 0017 0000 001f 0000 0004 0004 2220 0004 2220 0081 0024 0000 0000 0008 0c2c 0100 0017 0000 001f 0000 0004
0076720  0003 f4c0 0003 f4c0 0081 001c 0000 0000 0008 0c4c 0100 0017 0000 001f 0000 0004 0003 3924 0003 3924 0081 0010 0000 0000
0077000  0008 0c6c 0100 0017 0000 001f 0000 0004 0003 36dc 0003 36dc 0081 0010 0000 0000 0008 0c8c 0100 0017 0000 001f 0000 0004
0077060  0003 74a4 0003 74d4 0081 0014 0000 0000 0008 0cac 0100 0017 0000 001f 0000 0004 0003 1d04 0003 1d04 0081 0010 0000 0000
0077140  0008 0ccc 0100 0017 0000 001f 0000 0004 0003 8fe0 0003 8fe0 0081 0014 0000 0000 0008 0cec 0100 0017 0000 001f 0000 0004
0077220  0003 907c 0003 90dc 0081 0014 0000 0000 0008 0d0c 0100 0017 0000 001f 0000 0004 0002 c5b0 0002 c5b0 0081 000c 0000 0000
```

| | | | | | | | | | | | | | | | | | | | | | | | | |
|---|---|---|---|---|---|---|---|---|---|---|---|---|---|---|---|---|---|---|---|---|---|---|---|---|
| 0077300 | 0008 | 042c | 0100 | 0017 | 0000 | 001f | 0000 | 0004 | 0003 | 7e5c | 0003 | 7e5c | 0081 | 0014 | 0000 | 0000 | 0008 | 044c | 0100 | 0017 | 0000 | 001f | 0000 | 0004 |
| 0077360 | 0003 | c39c | 0003 | c39c | 00a1 | 0018 | 0000 | 000c | 0008 | 036c | 0100 | 0017 | 0000 | 001f | 0000 | 0004 | 0004 | 27c0 | 0004 | 27c0 | 0081 | 0024 | 0000 | 0000 |
| 0077440 | 0008 | 0d8c | 0100 | 0017 | 0000 | 0027 | 0000 | 0004 | 0003 | 1828 | 0003 | 1828 | 0081 | 000f | 0000 | 0000 | 0008 | 0dac | 0100 | 0017 | 0000 | 001f | 0000 | 0004 |
| 0077520 | 0002 | a888 | 0002 | a888 | 0081 | 000a | 0000 | 0000 | 0008 | 0dcc | 0100 | 0017 | 0000 | 001f | 0000 | 0004 | 0003 | c058 | 0003 | c058 | 00a1 | 0018 | 0000 | 0000 |
| 0077600 | 0008 | 0dec | 0100 | 0017 | 0000 | 001f | 0000 | 0004 | 0003 | 73a4 | 0003 | 73b8 | 0081 | 0014 | 0000 | 0000 | 0008 | 0e0c | 0100 | 0017 | 0000 | 001f | 0000 | 0004 |
| 0077660 | 0003 | 7a64 | 0003 | 7a9c | 0081 | 0014 | 0000 | 000c | 0008 | 0e2c | 0100 | 0017 | 0000 | 001f | 0000 | 0004 | 0002 | 6ed8 | 0002 | 6ed8 | 0081 | 0003 | 0000 | 0000 |
| 0077740 | 0008 | 0e4c | 0100 | 0017 | 0000 | 001f | 0000 | 0004 | 0002 | 6fc8 | 0002 | 7030 | 0081 | 0003 | 0000 | 0000 | 0008 | 0e6c | 0100 | 0017 | 0000 | 001f | 0000 | 0004 |
| 0100020 | 0003 | c5e4 | 0003 | c5e4 | 00a1 | 0018 | 0000 | 0000 | 0008 | 0e8c | 0100 | 0017 | 0000 | 001f | 0000 | 0004 | 0004 | b1ac | 0004 | b1ac | 0081 | 002d | 0000 | 0000 |
| 0100100 | 0008 | 0eac | 0100 | 0017 | 0000 | 001f | 0000 | 0004 | 0002 | 7884 | 0002 | 7884 | 0081 | 0005 | 0000 | 0000 | 0008 | 0ecc | 0100 | 0017 | 0000 | 001f | 0000 | 0004 |
| 0100160 | 0002 | 784c | 0002 | 794c | 0081 | 0005 | 0000 | 0000 | 0008 | 0eec | 0100 | 0017 | 0000 | 001f | 0000 | 0004 | 0003 | c9d0 | 0003 | c9d0 | 00a1 | 0018 | 0000 | 0000 |
| 0100240 | 0008 | 0f0c | 0100 | 0017 | 0000 | 001f | 0000 | 0004 | 0003 | c0a0 | 0003 | c0a0 | 00a1 | 0018 | 0000 | 0000 | 0008 | 0f2c | 0100 | 0017 | 0000 | 001f | 0000 | 0004 |
| 0100320 | 0004 | 0120 | 0004 | 0120 | 0081 | 001e | 0000 | 0000 | 0008 | 0f4c | 0100 | 0017 | 0000 | 001f | 0000 | 0004 | 0004 | 0fec | 0004 | 0fec | 0081 | 0022 | 0000 | 0000 |
| 0100400 | 0008 | 0f6c | 0100 | 0017 | 0000 | 002f | 0000 | 0004 | 0005 | 95c0 | 0005 | 95c0 | 0081 | 0037 | 0000 | 0000 | 0008 | 0f8c | 0100 | 0017 | 0000 | 001f | 0000 | 0004 |
| 0100460 | 0003 | c7d4 | 0003 | c7d4 | 00a1 | 0018 | 0000 | 0000 | 0008 | 0fac | 0100 | 0017 | 0000 | 002f | 0000 | 0004 | 0005 | 8d70 | 0005 | 8dc0 | 0081 | 0037 | 0000 | 0000 |
| 0100540 | 0008 | 0fcc | 0100 | 0017 | 0000 | 001f | 0000 | 0004 | 0004 | 0f94 | 0004 | 0f94 | 0081 | 0021 | 0000 | 0000 | 0008 | 0fec | 0100 | 0017 | 0000 | 001f | 0000 | 0004 |
| 0100620 | 0003 | 2808 | 0003 | 2808 | 0081 | 0010 | 0000 | 0000 | 0008 | 100c | 0100 | 0017 | 0000 | 0027 | 0000 | 0004 | 0004 | 6db8 | 0004 | 6db8 | 0081 | 0029 | 0000 | 0000 |
| 0100700 | 0008 | 102c | 0100 | 0017 | 0000 | 001f | 0000 | 0004 | 0005 | 8340 | 0005 | 838c | 0081 | 0035 | 0000 | 0000 | 0008 | 104c | 0100 | 0017 | 0000 | 001f | 0000 | 0004 |
| 0100760 | 0002 | d260 | 0002 | d260 | 0081 | 000c | 0000 | 0000 | 0008 | 106c | 0100 | 0017 | 0000 | 001f | 0000 | 0004 | 0005 | 7aac | 0005 | 7b6c | 0081 | 0035 | 0000 | 0000 |
| 0101040 | 0008 | 108c | 0100 | 0017 | 0000 | 001f | 0000 | 0004 | 0003 | 3e50 | 0003 | 3f78 | 0081 | 0011 | 0000 | 0000 | 0008 | 10ac | 0100 | 0017 | 0000 | 001f | 0000 | 0004 |
| 0101120 | 0005 | 26c8 | 0005 | 26c8 | 0081 | 0030 | 0000 | 0000 | 0008 | 10cc | 0100 | 0017 | 0000 | 001f | 0000 | 0004 | 0003 | c424 | 0003 | c424 | 00a1 | 0018 | 0000 | 0000 |
| 0101200 | 0008 | 10ec | 0100 | 0017 | 0000 | 001f | 0000 | 0004 | 0003 | fb5c | 0003 | fb5c | 0081 | 001e | 0000 | 0000 | 0008 | 110c | 0100 | 0017 | 0000 | 001f | 0000 | 0004 |
| 0101260 | 0004 | 0e6c | 0004 | 0e6c | 0081 | 0021 | 0000 | 0000 | 0008 | 112c | 0100 | 0017 | 0000 | 001f | 0000 | 0004 | 0004 | 0e94 | 0004 | 0e94 | 0081 | 0021 | 0000 | 0000 |
| 0101340 | 0008 | 114c | 0100 | 0017 | 0000 | 001f | 0000 | 0004 | 0004 | 0e80 | 0004 | 0e80 | 0081 | 0021 | 0000 | 0000 | 0008 | 116c | 0100 | 0017 | 0000 | 001f | 0000 | 0004 |
| 0101420 | 0004 | 006c | 0004 | 006c | 0081 | 001e | 0000 | 0000 | 0008 | 118c | 0100 | 0017 | 0000 | 001f | 0000 | 0004 | 0003 | faf0 | 0003 | faf0 | 0081 | 001e | 0000 | 0000 |
| 0101500 | 0008 | 11ac | 0100 | 0017 | 0000 | 001f | 0000 | 0004 | 0003 | fd54 | 0003 | fd54 | 0081 | 001e | 0000 | 0000 | 0008 | 11cc | 0100 | 0017 | 0000 | 002f | 0000 | 0004 |
| 0101560 | 0005 | 9d74 | 0005 | 9d74 | 0081 | 0037 | 0000 | 0000 | 0008 | 11ec | 0100 | 0017 | 0000 | 001f | 0000 | 0004 | 0004 | a60c | 0004 | a60c | 0081 | 002b | 0000 | 0000 |
| 0101640 | 0008 | 120c | 0100 | 0017 | 0000 | 001f | 0000 | 0004 | 0004 | 9a00 | 0004 | 9a58 | 0081 | 002a | 0000 | 0000 | 0008 | 122c | 0100 | 0017 | 0000 | 001f | 0000 | 0004 |
| 0101720 | 0004 | 99bc | 0004 | 99bc | 0081 | 002a | 0000 | 0000 | 0008 | 124c | 0100 | 0017 | 0000 | 001f | 0000 | 0004 | 0002 | c7ec | 0002 | c7ec | 0081 | 000c | 0000 | 0000 |
| 0102000 | 0008 | 126c | 0100 | 0017 | 0000 | 001f | 0000 | 0004 | 0003 | c684 | 0003 | c684 | 00a1 | 0018 | 0000 | 0000 | 0008 | 128c | 0100 | 0017 | 0000 | 002f | 0000 | 0004 |
| 0102060 | 0005 | 8b0c | 0005 | 8b0c | 00a1 | 0036 | 0000 | 0000 | 0008 | 12ac | 0100 | 0017 | 0000 | 001f | 0000 | 0004 | 0005 | 9fcc | 0005 | 9fcc | 0081 | 0039 | 0000 | 0000 |
| 0102140 | 0008 | 12cc | 0100 | 0017 | 0000 | 001f | 0000 | 0004 | 0003 | 6600 | 0003 | 6600 | 0081 | 0012 | 0000 | 0000 | 0008 | 12ec | 0100 | 0017 | 0000 | 001f | 0000 | 0004 |
| 0102220 | 0002 | 8908 | 0002 | 8908 | 0081 | 0008 | 0000 | 0000 | 0008 | 130c | 0100 | 0017 | 0000 | 001f | 0000 | 0004 | 0004 | ffe8 | 0004 | ffe8 | 0081 | 0030 | 0000 | 0000 |
| 0102300 | 0008 | 132c | 0100 | 0017 | 0000 | 0027 | 0000 | 0004 | 0005 | 8928 | 0005 | 8928 | 0081 | 0036 | 0000 | 0000 | 0008 | 134c | 0100 | 0017 | 0000 | 001f | 0000 | 0004 |
| 0102360 | 0004 | 3a50 | 0004 | 3a50 | 0081 | 0026 | 0000 | 0000 | 0008 | 136c | 0100 | 0017 | 0000 | 001f | 0000 | 0004 | 0002 | 4b3c | 0002 | 4b3c | 0081 | 0001 | 0000 | 0000 |
| 0102440 | 0008 | 138c | 0100 | 0017 | 0000 | 001f | 0000 | 0004 | 0002 | 4bd8 | 0002 | 4bd8 | 0081 | 0001 | 0000 | 0000 | 0008 | 13ac | 0100 | 0017 | 0000 | 001f | 0000 | 0004 |
| 0102520 | 0002 | 4b90 | 0002 | 4b90 | 0081 | 0001 | 0000 | 0000 | 0008 | 13cc | 0100 | 0017 | 0000 | 001f | 0000 | 0004 | 0002 | 4a98 | 0002 | 4a98 | 0081 | 0001 | 0000 | 0000 |
| 0102600 | 0008 | 13ec | 0100 | 0017 | 0000 | 001f | 0000 | 0004 | 0002 | 4990 | 0002 | 4990 | 0081 | 0001 | 0000 | 0000 | 0008 | 140c | 0100 | 0017 | 0000 | 001f | 0000 | 0004 |
| 0102660 | 0002 | 4ae0 | 0002 | 4ae0 | 0081 | 0001 | 0000 | 0000 | 0008 | 142c | 0100 | 0017 | 0000 | 001f | 0000 | 0004 | 0002 | 4a38 | 0002 | 4a38 | 0081 | 0001 | 0000 | 0000 |
| 0102740 | 0008 | 144c | 0100 | 0017 | 0000 | 001f | 0000 | 0004 | 0002 | 491c | 0002 | 491c | 0081 | 0001 | 0000 | 0000 | 0008 | 146c | 0100 | 0017 | 0000 | 001f | 0000 | 0004 |
| 0103020 | 0002 | 4974 | 0002 | 4974 | 0081 | 0001 | 0000 | 0000 | 0008 | 148c | 0100 | 0017 | 0000 | 001f | 0000 | 0004 | 0002 | 48b4 | 0002 | 48b4 | 0081 | 0001 | 0000 | 0000 |
| 0103100 | 0008 | 14ac | 0100 | 0017 | 0000 | 001f | 0000 | 0004 | 0002 | 6498 | 0002 | 6d98 | 0081 | 0003 | 0000 | 0000 | 0008 | 14cc | 0100 | 0017 | 0000 | 001f | 0000 | 0004 |
| 0103160 | 0002 | c750 | 0002 | c750 | 0081 | 000c | 0000 | 0000 | 0008 | 14ec | 0100 | 0017 | 0000 | 001f | 0000 | 0004 | 0003 | d478 | 0003 | d4b0 | 0081 | 001a | 0000 | 0000 |
| 0103240 | 0008 | 150c | 0100 | 0017 | 0000 | 001f | 0000 | 0004 | 0003 | ce98 | 0003 | ce98 | 0081 | 001a | 0000 | 0000 | 0008 | 152c | 0100 | 0017 | 0000 | 001f | 0000 | 0004 |
| 0103320 | 0003 | c668 | 0003 | c668 | 00a1 | 0018 | 0000 | 0000 | 0008 | 154c | 0100 | 0017 | 0000 | 001f | 0000 | 0004 | 0003 | 3038 | 0003 | 3038 | 0081 | 0010 | 0000 | 0000 |
| 0103400 | 0008 | 156c | 0100 | 0017 | 0000 | 001f | 0000 | 0004 | 0003 | c0b8 | 0003 | c0b8 | 00a1 | 0018 | 0000 | 0000 | 0008 | 158c | 0100 | 0017 | 0000 | 001f | 0000 | 0004 |
| 0103460 | 0003 | c76c | 0003 | c76c | 00a1 | 0018 | 0000 | 0000 | 0008 | 15ac | 0100 | 0017 | 0000 | 001f | 0000 | 0004 | 0005 | 8444 | 0005 | 847c | 0081 | 0035 | 0000 | 0000 |
| 0103540 | 0008 | 15cc | 0100 | 0017 | 0000 | 001f | 0000 | 0004 | 0003 | c128 | 0003 | c128 | 00a1 | 0018 | 0000 | 0000 | 0008 | 15ec | 0100 | 0017 | 0000 | 001f | 0000 | 0004 |
| 0103620 | 0004 | 9714 | 0004 | 9714 | 0081 | 002a | 0000 | 0000 | 0008 | 160c | 0100 | 0017 | 0000 | 001f | 0000 | 0004 | 0004 | 4340 | 0004 | 4340 | 0081 | 0027 | 0000 | 0000 |
| 0103700 | 0008 | 162c | 0100 | 0017 | 0000 | 001f | 0000 | 0004 | 0005 | 849c | 0005 | 849c | 0081 | 0035 | 0000 | 0000 | 0008 | 164c | 0100 | 0017 | 0000 | 001f | 0000 | 0004 |
| 0103760 | 0004 | 26a0 | 0004 | 26a0 | 0081 | 0024 | 0000 | 0000 | 0008 | 166c | 0100 | 0017 | 0000 | 001f | 0000 | 0004 | 0003 | c504 | 0003 | c504 | 00a1 | 0018 | 0000 | 0000 |
| 0104040 | 0008 | 168c | 0100 | 0017 | 0000 | 001f | 0000 | 0004 | 0002 | a32c | 0002 | a864 | 0081 | 000a | 0000 | 0000 | 0008 | 16ac | 0100 | 0017 | 0000 | 001f | 0000 | 0004 |
| 0104120 | 0002 | a804 | 0002 | a804 | 0081 | 000a | 0000 | 0000 | 0008 | 16cc | 0100 | 0017 | 0000 | 001f | 0000 | 0004 | 0005 | 9ecc | 0005 | 9ecc | 0081 | 0038 | 0000 | 0000 |
| 0104200 | 0008 | 16ec | 0100 | 0017 | 0000 | 001f | 0000 | 0004 | 0005 | 7cd8 | 0005 | 7cd8 | 0081 | 0035 | 0000 | 0000 | 0008 | 170c | 0100 | 0017 | 0000 | 001f | 0000 | 0004 |
| 0104260 | 0005 | 7c68 | 0005 | 7ca0 | 0081 | 0035 | 0000 | 0000 | 0008 | 172c | 0100 | 0017 | 0000 | 001f | 0000 | 0004 | 0002 | 6ea0 | 0002 | 6ea0 | 0081 | 0003 | 0000 | 0000 |
| 0104340 | 0008 | 174c | 0100 | 0017 | 0000 | 001f | 0000 | 0004 | 0003 | 9b90 | 0003 | 9b90 | 0081 | 0016 | 0000 | 0000 | 0008 | 176c | 0100 | 0017 | 0000 | 0027 | 0000 | 0004 |

```
0104420 0004 8b10 0004 8b10 0081 0029 0000 0000 0008 178c 0100 0017 0000 001f 0000 0004 0002 6f68 0002 6f68 0081 0003 0000 0000
0104500 0008 17ac 0100 0017 0000 001f 0000 0004 0004 c50c 0004 c50c 0081 0030 0000 0000 0008 17cc 0100 0017 0000 001f 0000 0004
0104560 0004 c540 0004 c540 0081 0030 0000 0000 0008 17ec 0100 0017 0000 001f 0000 0004 0002 799c 0002 799c 0081 0005 0000 0000
0104640 0008 180c 0100 0017 0000 001f 0000 0004 0003 c478 0003 c478 00a1 0018 0000 0000 0008 182c 0100 0017 0000 001f 0000 0004
0104720 0004 a598 0004 a598 0081 002b 0000 0000 0008 184c 0100 0017 0000 001f 0000 0004 0004 ff70 0004 ff70 0081 0030 0000 0000
0105000 0008 186c 0100 0017 0000 001f 0000 0004 0003 2e00 0003 2e00 0081 0010 0000 0000 0008 188c 0100 0017 0000 001f 0000 0004
0105060 0003 2ba0 0003 2ba0 0081 0010 0000 0000 0008 18ac 0100 0017 0000 001f 0000 0004 0005 a020 0005 a020 0081 0039 0000 0000
0105140 0008 18cc 0100 0017 0000 001f 0000 0004 0005 12a8 0005 12a8 0081 0030 0000 0000 0008 18ec 0100 0017 0000 001f 0000 0004
0105220 0003 53a8 0003 53a8 0081 0012 0000 0000 0008 190c 0100 0017 0000 001f 0000 0004 0005 2b1c 0005 2b64 0081 0030 0000 0000
0105300 0008 192c 0100 0017 0000 001f 0000 0004 0005 270c 0005 270c 0081 0030 0000 0000 0008 194c 0100 0017 0000 002f 0000 0004
0105360 0005 917c 0005 91a4 0081 0037 0000 0000 0008 196c 0100 0017 0000 001f 0000 0004 0004 a664 0004 a69c 0081 002b 0000 0000
0105440 0008 198c 0100 0017 0000 001f 0000 0004 0005 2680 0005 26bc 0081 0030 0000 0000 0008 19ac 0100 0017 0000 0037 0000 0004
0105520 0002 de2c 0002 de2c 0081 000d 0000 0000 0008 19cc 0100 0017 0000 003f 0000 0004 0005 5ee0 0005 5ee0 0081 0033 0000 0000
0105600 0008 19ec 0100 0017 0000 001f 0000 0004 0004 e1f4 0004 e298 0081 0030 0000 0000 0008 1a0c 0100 0017 0000 001f 0000 0004
0105660 0004 13f8 0004 13f8 0081 0023 0000 0000 0008 1a2c 0100 0017 0000 0027 0000 0004 0004 8474 0004 8474 0081 0029 0000 0000
0105740 0008 1a4c 0100 0017 0000 0027 0000 0004 0004 848c 0004 848c 0081 0029 0000 0000 0008 1a6c 0100 0017 0000 002f 0000 0004
0106020 0005 9684 0005 9684 0081 0037 0000 0000 0008 1a8c 0100 0017 0000 001f 0000 0004 0002 a30c 0002 a30c 0081 000a 0000 0000
0106100 0008 1aac 0100 0017 0000 001f 0000 0004 0004 380c 0004 380c 00a1 0025 0000 000c 0008 1acc 0100 0017 0000 0027 0000 0004
0106160 0003 1904 0003 1968 0081 000f 0000 0000 0008 1aec 0100 0017 0000 001f 0000 0004 0004 5ac0 0004 5af8 0081 0028 0000 0000
0106240 0008 1b0c 0100 0017 0000 001f 0000 0004 0002 d1e8 0002 d204 0081 000c 0000 0000 0008 1b2c 0100 0017 0000 001f 0000 0004
0106320 0002 4860 0002 48a8 0081 0001 0000 0000 0008 1b4c 0100 0017 0000 001f 0000 0004 0004 b4c8 0004 b4c8 0081 002f 0000 0000
0106400 0008 1b6c 0100 0017 0000 001f 0000 0004 0004 b500 0004 b500 0081 002f 0000 0000 0008 1b8c 0100 0017 0000 001f 0000 0004
0106460 0004 b538 0004 b538 0081 002f 0000 0000 0008 1bac 0100 0017 0000 001f 0000 0004 0004 b490 0004 b490 0081 002f 0000 0000
0106540 0008 1bcc 0100 0017 0000 001f 0000 0004 0004 ab90 0004 ab90 0081 002d 0000 0000 0008 1bec 0100 0017 0000 001f 0000 0004
0106620 0004 2580 0004 2580 0081 0024 0000 0000 0008 1c0c 0100 0017 0000 001f 0000 0004 0003 6bb4 0003 6bb4 0081 0012 0000 0000
0106700 0008 1c2c 0100 0017 0000 001f 0000 0004 0003 6b8c 0003 6b8c 0081 0012 0000 0000 0008 1c4c 0100 0017 0000 001f 0000 0004
0106760 0003 6b64 0003 6b64 0081 0012 0000 0000 0008 1c6c 0100 0017 0000 001f 0000 0004 0003 6bdc 0003 6bdc 0081 0012 0000 0000
0107040 0008 1c8c 0100 0017 0000 001f 0000 0004 0003 6b14 0003 6b14 0081 0012 0000 0000 0008 1cac 0100 0017 0000 001f 0000 0004
0107120 0003 6b3c 0003 6b3c 0081 0012 0000 0000 0008 1ccc 0100 0017 0000 002f 0000 0004 0005 8fb0 0005 8fb0 0081 0037 0000 0000
0107200 0008 1cec 0100 0017 0000 001f 0000 0004 0004 07c0 0004 07c0 0081 0020 0000 0000 0008 1d0c 0100 0017 0000 001f 0000 0004
0107260 0004 076c 0004 076c 0081 0020 0000 0000 0008 1d2c 0100 0017 0000 001f 0000 0004 0003 7798 0003 77c4 0081 0014 0000 0000
0107340 0008 1d4c 0100 0017 0000 0027 0000 0004 0004 6e50 0004 6e50 0081 0029 0000 0000 0008 1d6c 0100 0017 0000 001f 0000 0004
0107420 0004 c764 0004 c764 0081 0030 0000 0000 0008 1d8c 0100 0017 0000 001f 0000 0004 0003 5348 0003 5348 0081 0012 0000 0000
0107500 0008 1dac 0100 0017 0000 001f 0000 0004 0005 0278 0005 0278 0081 0030 0000 0000 0008 1dcc 0100 0017 0000 001f 0000 0004
0107560 0003 a180 0003 a180 0081 0017 0000 0000 0008 1dec 0100 0017 0000 001f 0000 0004 0002 8720 0002 8720 0081 0008 0000 0000
0107640 0008 1e0c 0100 0017 0000 001f 0000 0004 0003 a93c 0003 a93c 0081 0017 0000 0000 0008 1e2c 0100 0017 0000 001f 0000 0004
0107720 0004 cb20 0004 cb20 0081 0030 0000 0000 0008 1e4c 0100 0017 0000 001f 0000 0004 0002 82f8 0002 82f8 0081 0008 0000 0000
0110000 0008 1e6c 0100 0017 0000 001f 0000 0004 0004 c6c8 0004 c6c8 0081 0030 0000 0000 0008 1e8c 0100 0017 0000 001f 0000 0004
0110060 0004 ae34 0004 ae34 0081 002d 0000 0000 0008 1eac 0100 0017 0000 001f 0000 0004 0004 ef6c 0004 ef6c 0081 0030 0000 0000
0110140 0008 1ecc 0100 0017 0000 001f 0000 0004 0004 ef1c 0004 ef1c 0081 0030 0000 0000 0008 1eec 0100 0017 0000 001f 0000 0004
0110220 0003 1dac 0003 1dac 0081 0010 0000 0000 0008 1f0c 0100 0017 0000 001f 0000 0004 0003 ba3c 0003 ba3c 0081 0018 0000 0000
0110300 0008 1f2c 0100 0017 0000 0027 0000 0004 0003 1230 0003 1230 0081 000f 0000 0000 0008 1f4c 0100 0017 0000 001f 0000 0004
0110360 0004 0fcc 0004 0fdc 0081 0022 0000 0000 0008 1f6c 0100 0017 0000 001f 0000 0004 0003 c784 0003 c784 00a1 0018 0000 0000
0110440 0008 1f8c 0100 0017 0000 001f 0000 0004 0003 fc34 0003 fc34 0081 001e 0000 0000 0008 1fac 0100 0017 0000 001f 0000 0004
0110520 0003 f994 0003 faac 0081 001e 0000 0000 0008 1fcc 0100 0017 0000 001f 0000 0004 0002 78f4 0002 78f4 0081 0005 0000 0000
0110600 0008 1fec 0100 0017 0000 001f 0000 0004 0005 7d54 0005 7d54 0081 0035 0000 0000 0008 200c 0100 0017 0000 001f 0000 0004
0110660 0003 b2dc 0003 b2dc 0081 0017 0000 0000 0008 202c 0100 0017 0000 001f 0000 0004 0003 b254 0003 b254 0081 0017 0000 0000
0110740 0008 204c 0100 0017 0000 001f 0000 0004 0004 ae94 0004 ae94 0081 002d 0000 0000 0008 206c 0100 0017 0000 001f 0000 0004
0111020 0003 bce0 0003 bce0 0081 0018 0000 0000 0008 208c 0100 0017 0000 001f 0000 0004 0004 b138 0004 b138 0081 002d 0000 0000
0111100 0008 20ac 0100 0017 0000 001f 0000 0004 0003 cbbc 0003 cbbc 00a1 0018 0000 0000 0008 20cc 0100 0017 0000 001f 0000 0004
0111160 0003 c43c 0003 c43c 00a1 0018 0000 0000 0008 20ec 0100 0017 0000 001f 0000 0004 0004 0ea8 0004 0ea8 0081 0021 0000 0000
0111240 0008 210c 0100 0017 0000 001f 0000 0004 0004 0ed8 0004 0ed8 0081 0021 0000 0000 0008 212c 0100 0017 0000 001f 0000 0004
0111320 0004 0ec0 0004 0ec0 0081 0021 0000 0000 0008 214c 0100 0017 0000 001f 0000 0004 0003 ffd4 0003 ffd4 0081 001e 0000 0000
0111400 0008 216c 0100 0017 0000 001f 0000 0004 0004 3e44 0004 3e84 0081 0026 0000 0000 0008 218c 0100 0017 0000 001f 0000 0004
0111460 0004 0f04 0004 0f04 0081 0021 0000 0000 0008 21ac 0100 0017 0000 001f 0000 0004 0002 86f4 0002 86f4 0081 0008 0000 0000
```

```
0111540 0008 21cc 0100 0017 0000 0027 0000 0004 0004 83bc 0004 83f4 0081 0029 0000 0000 0008 21ec 0100 0017 0000 0027 0000 0004
0111620 0005 8aac 0005 8aac 0081 0036 0000 0000 0008 220c 0100 0017 0000 001f 0000 0004 0003 67e0 0003 67e0 0081 0012 0000 0000
0111700 0008 222c 0100 0017 0000 001f 0000 0004 0003 bb6c 0003 bb6c 0081 0018 0000 0000 0008 224c 0100 0017 0000 001f 0000 0004
0111760 0003 c7bc 0003 c7bc 00a1 0018 0000 0000 0008 226c 0100 0017 0000 001f 0000 0004 0003 c7a0 0003 c7a0 00a1 0018 0000 0000
0112040 0008 228c 0100 0017 0000 001f 0000 0004 0003 ca34 0003 ca34 00a1 0018 0000 0000 0008 22ac 0100 0017 0000 001f 0000 0004
0112120 0003 ca6c 0003 ca6c 00a1 0018 0000 0000 0008 22cc 0100 0017 0000 001f 0000 0004 0003 c8f0 0003 c8f0 00a1 0018 0000 0000
0112200 0008 22ec 0100 0017 0000 001f 0000 0004 0004 a4a4 0004 a4a4 0081 002b 0000 0000 0008 230c 0100 0017 0000 001f 0000 0004
0112260 0004 a30c 0004 a330 0081 002b 0000 0000 0008 232c 0100 0017 0000 001f 0000 0004 0003 a454 0003 a4ac 0081 0017 0000 0000
0112340 0008 234c 0100 0017 0000 001f 0000 0004 0003 3658 0003 36cc 0081 0010 0000 0000 0008 236c 0100 0017 0000 001f 0000 0004
0112420 0003 390c 0003 390c 0081 0010 0000 0000 0008 238c 0100 0017 0000 003f 0000 0004 0005 5cfc 0005 5cfc 0081 0033 0000 0000
0112500 0008 23ac 0100 0017 0000 001f 0000 0004 0003 5c0c 0003 5c58 0081 0012 0000 0000 0008 23cc 0100 0017 0000 001f 0000 0004
0112560 0005 26e8 0005 2700 0081 0030 0000 0000 0008 23ec 0100 0017 0000 001f 0000 0004 0003 cf74 0003 cf74 0081 001a 0000 0000
0112640 0008 240c 0100 0017 0000 001f 0000 0004 0003 8c80 0003 8cb8 0081 0014 0000 0000 0008 242c 0100 0017 0000 001f 0000 0004
0112720 0004 96ec 0004 96ec 0081 002a 0000 0000 0008 244c 0100 0017 0000 001f 0000 0004 0004 95cc 0004 95cc 0081 002a 0000 0000
0113000 0008 246c 0100 0017 0000 001f 0000 0004 0004 1074 0004 1074 0081 0022 0000 0000 0008 248c 0100 0017 0000 001f 0000 0004
0113060 0003 b98c 0003 b98c 0081 0018 0000 0000 0008 24ac 0100 0017 0000 001f 0000 0004 0002 9fe4 0002 9fe4 0081 0009 0000 0000
0113140 0008 24cc 0100 0017 0000 001f 0000 0004 0002 9fb0 0002 9fb0 0081 0009 0000 0000 0008 24ec 0100 0017 0000 001f 0000 0004
0113220 0002 9870 0002 9870 0081 0009 0000 0000 0008 250c 0100 0017 0000 001f 0000 0004 0002 98c4 0002 98c4 0081 0009 0000 0000
0113300 0008 252c 0100 0017 0000 001f 0000 0004 0002 9a68 0002 9a68 0081 0009 0000 0000 0008 254c 0100 0017 0000 001f 0000 0004
0113360 0002 96a4 0002 96a4 0081 0009 0000 0000 0008 256c 0100 0017 0000 001f 0000 0004 0002 98f4 0002 98f4 0081 0009 0000 0000
0113440 0008 258c 0100 0017 0000 001f 0000 0004 0002 9924 0002 9924 0081 0009 0000 0000 0008 25ac 0100 0017 0000 001f 0000 0004
0113520 0002 95d4 0002 95d4 0081 0009 0000 0000 0008 25cc 0100 0017 0000 001f 0000 0004 0002 8f40 0002 8f40 0081 0009 0000 0000
0113600 0008 25ec 0100 0017 0000 001f 0000 0004 0002 9aa8 0002 9aa8 0081 0009 0000 0000 0008 260c 0100 0017 0000 001f 0000 0004
0113660 0004 0428 0004 0428 0081 001f 0000 0000 0008 262c 0100 0017 0000 0027 0000 0004 0004 7554 0004 7554 0081 0029 0000 0000
0113740 0008 264c 0100 0017 0000 0027 0000 0004 0004 7510 0004 7510 0081 0029 0000 0000 0008 266c 0100 0017 0000 001f 0000 0004
0114020 0005 8030 0005 8068 0081 0035 0000 0000 0008 268c 0100 0017 0000 001f 0000 0004 0004 399c 0004 399c 0081 0026 0000 0000
0114100 0008 26ac 0100 0017 0000 001f 0000 0004 0004 0ca8 0004 0cb8 0081 0020 0000 0000 0008 26cc 0100 0017 0000 001f 0000 0004
0114160 0004 0d74 0004 0d84 0081 0020 0000 0000 0008 26ec 0100 0017 0000 001f 0000 0004 0005 a02c 0005 a02c 0081 0039 0000 0000
0114240 0008 270c 0100 0017 0000 001f 0000 0004 0003 b47c 0003 b518 0081 0017 0000 0000 0008 272c 0100 0017 0000 001f 0000 0004
0114320 0005 a038 0005 a038 0081 0039 0000 0000 0008 274c 0100 0017 0000 001f 0000 0004 0003 d2bc 0003 d3e0 0081 001a 0000 0000
0114400 0008 276c 0100 0017 0000 001f 0000 0004 0003 d3f0 0003 d3f0 0081 001a 0000 0000 0008 278c 0100 0017 0000 0027 0000 0004
0114460 0004 732c 0004 73a4 0081 0029 0000 0000 0008 27ac 0100 0017 0000 0027 0000 0004 0004 8c68 0004 8ca0 0081 0029 0000 0000
0114540 0008 27cc 0100 0017 0000 001f 0000 0004 0004 3c84 0004 3d30 0081 0026 0000 0000 0008 27ec 0100 0017 0000 001f 0000 0004
0114620 0005 a008 0005 a008 0081 0039 0000 0000 0008 280c 0100 0017 0000 001f 0000 0004 0004 98f0 0004 999c 0081 002a 0000 0000
0114700 0008 282c 0100 0017 0000 001f 0000 0004 0003 e654 0003 e654 0081 001a 0000 0000 0008 284c 0100 0017 0000 001f 0000 0004
0114760 0002 5528 0002 5528 0081 0003 0000 0000 0008 286c 0100 0017 0000 001f 0000 0004 0002 d03c 0002 d03c 0081 000c 0000 0000
0115040 0008 288c 0100 0017 0000 001f 0000 0004 0003 feac 0003 feac 0081 001e 0000 0000 0008 28ac 0100 0017 0000 0027 0000 0004
0115120 0004 9310 0004 93d4 0081 0029 0000 0000 0008 28cc 0100 0017 0000 0027 0000 0004 0004 9290 0004 9290 0081 0029 0000 0000
0115200 0008 28ec 0100 0017 0000 0027 0000 0004 0004 6138 0004 6138 0081 0029 0000 0000 0008 290c 0100 0017 0000 0027 0000 0004
0115260 0004 6cf8 0004 6cf8 0081 0029 0000 0000 0008 292c 0100 0017 0000 0027 0000 0004 0004 6d78 0004 6d78 0081 0029 0000 0000
0115340 0008 294c 0100 0017 0000 001f 0000 0004 0002 7964 0002 7964 0081 0005 0000 0000 0008 296c 0100 0017 0000 001f 0000 0004
0115420 0002 792c 0002 792c 0081 0005 0000 0000 0008 298c 0100 0017 0000 001f 0000 0004 0002 7ce8 0002 7ce8 0081 0006 0000 0000
0115500 0008 29ac 0100 0017 0000 001f 0000 0004 0003 727c 0003 72b4 0081 0014 0000 0000 0008 29cc 0100 0017 0000 001f 0000 0004
0115560 0003 c4e8 0003 c4e8 00a1 0019 0000 0000 0008 29ec 0100 0017 0000 003f 0000 0004 0005 5e34 0005 5e34 0081 0033 0000 0000
0115640 0008 2a0c 0100 0017 0000 001f 0000 0004 0004 f3c0 0004 f3c0 0081 0030 0000 0000 0008 2a2c 0100 0017 0000 0027 0000 0004
0115720 0003 06b0 0003 06b0 0081 000f 0000 0000 0008 2a4c 0100 0017 0000 001f 0000 0004 0003 5b04 0003 5b50 0081 0012 0000 0000
0116000 0008 2a6c 0100 0017 0000 001f 0000 0004 0003 bae0 0003 bae0 0081 0018 0000 0000 0008 2a8c 0100 0017 0000 001f 0000 0004
0116060 0003 6158 0003 621c 0081 0012 0000 0000 0008 2aac 0100 0017 0000 001f 0000 0004 0003 81f0 0003 8204 0081 0014 0000 0000
0116140 0008 2acc 0100 0017 0000 001f 0000 0004 0005 3874 0005 3874 0081 0030 0000 0000 0008 2aec 0100 0017 0000 001f 0000 0004
0116220 0002 4c2c 0002 4c2c 0081 0001 0000 0000 0008 2b0c 0100 0017 0000 001f 0000 0004 0002 826c 0002 826c 0081 0008 0000 0000
0116300 0008 2b2c 0100 0017 0000 001f 0000 0004 0002 47a0 0002 47e0 0081 0001 0000 0000 0008 2b4c 0100 0017 0000 001f 0000 0004
0116360 0005 00ac 0005 00ac 0081 0030 0000 0000 0008 2b6c 0100 0017 0000 0027 0000 0004 0005 8860 0005 8860 0081 0036 0000 0000
0116440 0008 2b8c 0100 0017 0000 001f 0000 0004 0004 e1c8 0004 e1dc 0081 0030 0000 0000 0008 2bac 0100 0017 0000 001f 0000 0004
0116520 0003 54a0 0003 54a0 0081 0012 0000 0000 0008 2bcc 0100 0017 0000 0027 0000 0004 0003 0684 0003 0694 0081 000f 0000 0000
0116600 0008 2bec 0100 0017 0000 0027 0000 0004 0003 1700 0003 1720 0081 000f 0000 0000 0008 2c0c 0100 0017 0000 001f 0000 0004
```

```
0116660 0003 7344 0003 7344 0081 0014 0000 0000 0008 2c2c 0100 0017 0000 001f 0000 0004 0003 8cf0 0003 8d1c 0081 0014 0000 0000
0116740 0008 2c4c 0100 0017 0000 001f 0000 0004 0003 8d98 0003 8dc4 0081 0014 0000 0000 0008 2c6c 0100 0017 0000 001f 0000 0004
0117020 0003 e600 0003 e600 0081 001a 0000 0000 0008 2c8c 0100 0017 0000 002f 0000 0004 0005 9dcc 0005 9dcc 0081 0037 0000 0000
0117100 0008 2cac 0100 0017 0000 001f 0000 0004 0003 a814 0003 a814 0081 0017 0000 0000 0008 2ccc 0100 0017 0000 0027 0000 0004
0117160 0004 7aac 0004 7aac 0081 0029 0000 0000 0008 2cec 0100 0017 0000 002f 0000 0004 0005 9c84 0005 9c84 0081 0037 0000 0000
0117240 0008 2d0c 0100 0017 0000 002f 0000 0004 0005 9e20 0005 9e20 0081 0037 0000 0000 0008 2d2c 0100 0017 0000 002f 0000 0004
0117320 0005 9c38 0005 9c5c 0081 0037 0000 0000 0008 2d4c 0100 0017 0000 001f 0000 0004 0002 78bc 0002 78bc 0081 0005 0000 0000
0117400 0008 2d6c 0100 0017 0000 001f 0000 0004 0004 a9f8 0004 aa9c 0081 0024 0000 0000 0008 2d8c 0100 0017 0000 001f 0000 0004
0117460 0005 0724 0005 0724 0081 0030 0000 0000 0008 21ac 0100 0017 0000 001f 0000 0004 0005 06bc 0005 06bc 0081 0030 0000 0000
0117540 0008 2dcc 0100 0017 0000 001f 0000 0004 0005 0664 0005 0664 0081 0030 0000 0000 0008 2dec 0100 0017 0000 001f 0000 0004
0117620 0003 c040 0003 c040 00a1 0018 0000 0000 0008 2e0c 0100 0017 0000 001f 0000 0004 0004 45d8 0004 45d8 0081 0027 0000 0000
0117700 0008 2e2c 0100 0017 0000 0027 0000 0004 0004 64a8 0004 64a8 0081 0029 0000 0000 0008 2e4c 0100 0017 0000 0027 0000 0004
0117760 0004 67a0 0004 696c 0081 0029 0000 0000 0008 2e6c 0100 0017 0000 001f 0000 0004 0003 92d0 0003 9308 0081 0014 0000 0000
0120040 0008 2e8c 0100 0017 0000 001f 0000 0004 0004 110c 0004 110c 0081 0023 0000 0000 0008 2eac 0100 0017 0000 0027 0000 0004
0120120 0005 89ac 0005 88ac 0081 0036 0000 0000 0008 2ecc 0100 0017 0000 001f 0000 0004 0002 47ec 0002 47ec 0081 0001 0000 0000
0120200 0008 2eec 0100 0017 0000 001f 0000 0004 0004 c414 0004 c414 0081 002f 0000 0000 0008 2f0c 0100 0017 0000 001f 0000 0004
0120260 0004 bfe0 0004 bfe0 0081 002f 0000 0000 0008 2f2c 0100 0017 0000 001f 0000 0004 0003 7f60 0003 7f9c 0081 0014 0000 0000
0120340 0008 2f4c 0100 0017 0000 001f 0000 0004 0002 46e4 0002 46e4 0081 0001 0000 0000 0008 2f6c 0100 0017 0000 001f 0000 0004
0120420 0003 64c8 0003 64c8 0081 0012 0000 0000 0008 2f8c 0200 0017 0000 001f 0000 0008 0003 78cc 0003 78cc 0081 0014 0000 0000
0120500 0008 2fac 0200 0017 0000 001f 0000 0008 0004 44cc 0004 44cc 0081 0027 0000 0000 0008 2fcc 0200 0017 0000 001f 0000 0008
0120560 0004 4b68 0004 4b68 0081 0027 0000 0000 0008 2fec 0200 0017 0000 001f 0000 0008 0004 54cc 0004 54cc 0081 0027 0000 0000
0120640 0008 300c 0200 0017 0000 0037 0000 0008 0002 f4d4 0002 f50c 0081 000d 0000 0000 0008 302c 0200 0017 0000 001f 0000 0008
0120720 0004 538c 0004 5494 0081 0027 0000 0000 0008 304c 0200 0017 0000 001f 0000 0008 0004 5308 0004 5308 0081 0027 0000 0000
0121000 0008 306c 0200 0017 0000 0027 0000 0008 0004 913c 0004 913c 0081 0029 0000 0000 0008 308c 0200 0017 0000 001f 0000 0008
0121060 0003 4cb8 0003 4cb8 0081 0012 0000 0000 0008 30ac 0200 0017 0000 001f 0000 0008 0005 0890 0005 0890 0081 0030 0000 0000
0121140 0008 30cc 0200 0017 0000 001f 0000 0008 0003 9350 0003 936c 0081 0014 0000 0000 0008 30ec 0200 0017 0000 001f 0000 0008
0121220 0003 c734 0003 c734 00a1 0018 0000 0000 0008 310c 0200 0017 0000 001f 0000 0008 0004 22c8 0004 22c8 0081 0024 0000 0000
0121300 0008 312c 0200 0017 0000 001f 0000 0008 0003 f494 0003 f4b4 0081 001c 0000 0000 0008 314c 0200 0017 0000 001f 0000 0008
0121360 0004 2e04 0004 2e04 0081 0025 0000 0000 0008 316c 0200 0017 0000 001f 0000 0008 0003 1cd4 0003 1cec 0081 0010 0000 0000
0121440 0008 318c 0200 0017 0000 001f 0000 0008 0003 900c 0003 9044 0081 0014 0000 0000 0008 31ac 0200 0017 0000 002f 0000 0008
0121520 0005 94b0 0005 94b0 0081 0037 0000 0000 0008 31cc 0200 0017 0000 001f 0000 0008 0003 361c 0003 3640 0081 0010 0000 0000
0121600 0008 31ec 0200 0017 0000 001f 0000 0008 0003 1ca4 0003 1cbc 0081 0010 0000 0000 0008 320c 0200 0017 0000 001f 0000 0008
0121660 0003 8778 0003 8778 0081 0014 0000 0000 0008 322c 0200 0017 0000 001f 0000 0008 0003 cb68 0003 cb68 00a1 0018 0000 0000
0121740 0008 324c 0200 0017 0000 001f 0000 0008 0002 cd00 0002 cd00 0081 000c 0000 0000 0008 326c 0200 0017 0000 001f 0000 0008
0122020 0005 4278 0005 4310 0081 0031 0000 0000 0008 328c 0200 0017 0000 001f 0000 0008 0004 387c 0004 387c 0081 0026 0000 0000
0122100 0008 32ac 0200 0017 0000 0027 0000 0008 0004 8128 0004 8128 0081 0029 0000 0000 0008 32cc 0200 0017 0000 001f 0000 0008
0122160 0002 6e84 0002 6e84 0081 0003 0000 0000 0008 32ec 0200 0017 0000 001f 0000 0008 0002 7048 0002 7048 0081 0003 0000 0000
0122240 0008 330c 0200 0017 0000 001f 0000 0008 0004 e850 0004 e850 0081 0030 0000 0000 0008 332c 0200 0017 0000 001f 0000 0008
0122320 0004 e7d0 0004 e7d0 0081 0030 0000 0000 0008 334c 0200 0017 0000 0027 0000 0008 0004 8d3c 0004 8d90 0081 0029 0000 0000
0122400 0008 336c 0200 0017 0000 001f 0000 0008 0004 e9bc 0004 e9f8 0081 0030 0000 0000 0008 338c 0200 0017 0000 001f 0000 0008
0122460 0004 312c 0004 3160 0081 0025 0000 0000 0008 33ac 0200 0017 0000 001f 0000 0008 0004 31f4 0004 3258 0081 0025 0000 0000
0122540 0008 33cc 0200 0017 0000 001f 0000 0008 0004 32cc 0004 32cc 0081 0025 0000 0000 0008 33ec 0200 0017 0000 001f 0000 0008
0122620 0003 63ac 0003 64bc 0081 0012 0000 0000 0008 340c 0200 0017 0000 001f 0000 0008 0004 58c0 0004 593c 0081 0027 0000 0000
0122700 0008 342c 0200 0017 0000 001f 0000 0008 0004 594c 0004 594c 0081 0027 0000 0000 0008 344c 0200 0017 0000 001f 0000 0008
0122760 0003 bfc4 0003 bfc4 00a1 0018 0000 0000 0008 346c 0200 0017 0000 001f 0000 0008 0003 c10c 0003 c10c 00a1 0018 0000 0000
0123040 0008 348c 0200 0017 0000 001f 0000 0008 0003 c458 0003 c458 00a1 0018 0000 0000 0008 34ac 0200 0017 0000 001f 0000 0008
0123120 0003 38a8 0003 38a8 0081 0010 0000 0000 0008 34cc 0200 0017 0000 001f 0000 0008 0002 fdec 0002 fe8c 0081 000e 0000 0000
0123200 0008 34ec 0200 0017 0000 0037 0000 0008 0002 f760 0002 f760 0081 000d 0000 0000 0008 350c 0200 0017 0000 001f 0000 0008
0123260 0004 9afc 0004 9afc 0081 002a 0000 0000 0008 352c 0200 0017 0000 001f 0000 0008 0003 c7ec 0003 c7ec 00a1 0018 0000 0000
0123340 0008 354c 0200 0017 0000 001f 0000 0008 0005 8284 0005 8284 0081 0035 0000 0000 0008 356c 0200 0017 0000 001f 0000 0008
0123420 0004 1704 0004 1704 0081 0023 0000 0000 0008 358c 0200 0017 0000 001f 0000 0008 0003 32a0 0003 32d8 0081 0010 0000 0000
0123500 0008 35ac 0200 0017 0000 001f 0000 0008 0003 3244 0003 3278 0081 0010 0000 0000 0008 35cc 0200 0017 0000 002f 0000 0008
0123560 0005 9cb4 0005 9cb4 0081 0037 0000 0000 0008 35ec 0200 0017 0000 001f 0000 0008 0003 fec8 0003 ff5c 0081 001e 0000 0000
0123640 0008 360c 0200 0017 0000 001f 0000 0008 0005 3cfc 0005 3d3c 0081 0031 0000 0000 0008 362c 0200 0017 0000 001f 0000 0008
0123720 0003 3a70 0003 3a70 0081 0010 0000 0000 0008 364c 0200 0017 0000 001f 0000 0008 0003 3a44 0003 3a44 0081 0010 0000 0000
```

```
0124000  0008 366c 0200 0017 0000 001f 0000 0008 0004 32dc 0004 32dc 0081 0025 0000 0000 0008 368c 0200 0017 0000 001f 0000 0008
0124060  0005 0ba4 0005 0c20 0081 0030 0000 0000 0008 36ac 0200 0017 0000 0027 0000 0008 0004 94c0 0004 9500 0081 0029 0000 0000
0124140  0008 36cc 0200 0017 0000 0027 0000 0008 0004 7050 0004 7050 0081 0029 0000 0000 0008 36ec 0200 0017 0000 0027 0000 0008
0124220  0004 9088 0004 9130 0081 0029 0000 0000 0008 370c 0200 0017 0000 0027 0000 0008 0004 9028 0004 9028 0081 0029 0000 0000
0124300  0008 372c 0200 0017 0000 0027 0000 0008 0004 7490 0004 7490 0081 0029 0000 0000 0008 374c 0200 0017 0000 001f 0000 0008
0124360  0005 83d0 0005 83d0 0081 0035 0000 0000 0008 376c 0200 0017 0000 001f 0000 0008 0003 3fb0 0003 4308 0081 0011 0000 0000
0124440  0008 378c 0200 0017 0000 0027 0000 0008 0004 7bf8 0004 7bf8 0081 0029 0000 0000 0008 37ac 0200 0017 0000 001f 0000 0008
0124520  0004 bd10 0004 bd10 0081 002f 0000 0000 0008 37cc 0200 0017 0000 001f 0000 0008 0003 f594 0003 f594 0081 001c 0000 0000
0124600  0008 37ec 0200 0017 0000 001f 0000 0008 0003 fca0 0003 fca0 0081 001e 0000 0000 0008 380c 0200 0017 0000 002f 0000 0008
0124660  0005 951c 0005 951c 0081 0037 0000 0000 0008 382c 0200 0017 0000 002f 0000 0008 0005 9580 0005 9598 0081 0037 0000 0000
0124740  0008 384c 0200 0017 0000 002f 0000 0008 0005 8b28 0005 8b28 00a1 0036 0000 0000 0008 386c 0200 0017 0000 001f 0000 0008
0125020  0003 ffa8 0003 ffa8 0081 001e 0000 0000 0008 388c 0200 0017 0000 001f 0000 0008 0004 b114 0004 b128 0081 002d 0000 0000
0125100  0008 38ac 0200 0017 0000 001f 0000 0008 0003 c6a0 0003 c6a0 00a1 0018 0000 0000 0008 38cc 0200 0017 0000 001f 0000 0008
0125160  0003 ec74 0003 ecdc 0081 001c 0000 0000 0008 38ec 0200 0017 0000 001f 0000 0008 0003 7b74 0003 7b74 0081 0014 0000 0000
0125240  0008 390c 0200 0017 0000 001f 0000 0008 0003 e6b4 0003 e6b4 0081 001a 0000 0000 0008 392c 0200 0017 0000 001f 0000 0008
0125320  0002 86b8 0002 86e8 0081 0008 0000 0000 0008 394c 0200 0017 0000 001f 0000 0008 0002 876c 0002 876c 0081 0008 0000 0000
0125400  0008 396c 0200 0017 0000 001f 0000 0008 0002 8890 0002 8890 0081 0008 0000 0000 0008 398c 0200 0017 0000 001f 0000 0008
0125460  0002 8818 0002 8818 0081 0008 0000 0000 0008 39ac 0200 0017 0000 001f 0000 0008 0002 87fc 0002 87fc 0081 0008 0000 0000
0125540  0008 39cc 0200 0017 0000 001f 0000 0008 0003 1fa0 0003 1fa0 0081 0010 0000 0000 0008 39ec 0200 0017 0000 001f 0000 0008
0125620  0002 8790 0002 8790 0081 0008 0000 0000 0008 3a0c 0200 0017 0000 001f 0000 0008 0002 a3e4 0002 a3e4 0081 000a 0000 0000
0125700  0008 3a2c 0200 0017 0000 001f 0000 0008 0003 8bd4 0003 8bd4 0081 0014 0000 0000 0008 3a4c 0200 0017 0000 0027 0000 0008
0125760  0004 75e0 0004 763c 0081 0029 0000 0000 0008 3a6c 0200 0017 0000 001f 0000 0008 0003 a9b8 0003 aa0c 0081 0017 0000 0000
0126040  0008 3a8c 0200 0017 0000 001f 0000 0008 0003 a89c 0003 a89c 0081 0017 0000 0000 0008 3aac 0200 0017 0000 001f 0000 0008
0126120  0003 a8e4 0003 a930 0081 0017 0000 0000 0008 3acc 0200 0017 0000 001f 0000 0008 0004 0c54 0004 0c9c 0081 0020 0000 0000
0126200  0008 3aec 0200 0017 0000 001f 0000 0008 0004 0f44 0004 0f44 0081 0021 0000 0000 0008 3b0c 0200 0017 0000 001f 0000 0008
0126260  0005 9fd8 0005 9fd8 0081 0039 0000 0000 0008 3b2c 0200 0017 0000 001f 0000 0008 0004 0f6c 0004 0f6c 0081 0021 0000 0000
0126340  0008 3b4c 0200 0017 0000 001f 0000 0008 0004 0f1c 0004 0f1c 0081 0021 0000 0000 0008 3b6c 0200 0017 0000 001f 0000 0008
0126420  0002 49f4 0002 49f4 0081 0001 0000 0000 0008 3b8c 0200 0017 0000 0027 0000 0008 0003 05b0 0003 0674 0081 000f 0000 0000
0126500  0008 3bac 0200 0017 0000 0027 0000 0008 0005 89b8 0005 89b8 0081 0036 0000 0000 0008 3bcc 0200 0017 0000 001f 0000 0008
0126560  0003 e71c 0003 e72c 0081 001a 0000 0000 0008 3bec 0200 0017 0000 001f 0000 0008 0003 cd9c 0003 cd9c 0081 001a 0000 0000
0126640  0008 3c0c 0200 0017 0000 001f 0000 0008 0004 11ac 0004 11fc 0081 0023 0000 0000 0008 3c2c 0200 0017 0000 001f 0000 0008
0126720  0004 124c 0004 124c 0081 0023 0000 0000 0008 3c4c 0200 0017 0000 001f 0000 0008 0004 1f74 0004 1f74 0081 0023 0000 0000
0127000  0008 3c6c 0200 0017 0000 001f 0000 0008 0003 bf6c 0003 bf6c 00a1 0018 0000 0000 0008 3c8c 0200 0017 0000 001f 0000 0008
0127060  0003 bfa8 0003 bfa8 00a1 0018 0000 0000 0008 3cac 0200 0017 0000 001f 0000 0008 0003 c408 0003 c408 00a1 0018 0000 0000
0127140  0008 3ccc 0200 0017 0000 001f 0000 0008 0004 56e0 0004 5738 0081 0027 0000 0000 0008 3cec 0200 0017 0000 001f 0000 0008
0127220  0002 cd5c 0002 cd5c 0081 000c 0000 0000 0008 3d0c 0200 0017 0000 001f 0000 0008 0003 2724 0003 2724 0081 0010 0000 0000
0127300  0008 3d2c 0200 0017 0000 001f 0000 0008 0003 b908 0003 b930 0081 0018 0000 0000 0008 3d4c 0200 0017 0000 001f 0000 0008
0127360  0003 c0c0 0003 c300 00a1 0018 0000 0000 0008 3d6c 0200 0017 0000 001f 0000 0008 0004 9764 0004 9764 0081 002a 0000 0000
0127440  0008 3d8c 0200 0017 0000 001f 0000 0008 0003 f77c 0003 f77c 0081 001d 0000 0000 0008 3dac 0200 0017 0000 002f 0000 0008
0127520  0005 9800 0005 9800 0081 0037 0000 0000 0008 3dcc 0200 0017 0000 002f 0000 0008 0005 97a0 0005 97a0 0081 0037 0000 0000
0127600  0008 3dec 0200 0017 0000 001f 0000 0008 0005 84fc 0005 8510 0081 0035 0000 0000 0008 3e0c 0200 0017 0000 0027 0000 0008
0127660  0004 7dd4 0004 7dd4 0081 0029 0000 0000 0008 3e2c 0200 0017 0000 001f 0000 0008 0003 e01c 0003 e01c 0081 001a 0000 0000
0127740  0008 3e4c 0200 0017 0000 001f 0000 0008 0005 1aa4 0005 1aa4 0081 0030 0000 0000 0008 3e6c 0200 0017 0000 001f 0000 0008
0130020  0003 9d4c 0003 9da8 0081 0016 0000 0000 0008 3e8c 0200 0017 0000 001f 0000 0008 0004 3940 0004 3990 0081 0026 0000 0000
0130100  0008 3eac 0200 0017 0000 001f 0000 0008 0003 df50 0003 e010 0081 001a 0000 0000 0008 3ecc 0200 0017 0000 001f 0000 0008
0130160  0005 1cb0 0005 1cb0 0081 0030 0000 0000 0008 3eec 0200 0017 0000 239f 0000 0008 0005 a044 0005 a044 0081 0039 0000 0000
0130240  0008 3f0c 0200 0017 0000 001f 0000 0008 0004 3a9c 0004 3b08 0081 0026 0000 0000 0008 3f2c 0200 0017 0000 001f 0000 0008
0130320  0003 ceb8 0003 cf24 0081 001a 0000 0000 0008 3f4c 0200 0017 0000 001f 0000 0008 0003 c84c 0003 c84c 00a1 0018 0000 0000
0130400  0008 3f6c 0200 0017 0000 001f 0000 0008 0003 c228 0003 c228 00a1 0018 0000 0000 0008 3f8c 0200 0017 0000 001f 0000 0008
0130460  0003 c20c 0003 c20c 00a1 0018 0000 0000 0008 3fac 0200 0017 0000 001f 0000 0008 0003 c490 0003 c490 00a1 0018 0000 0000
0130540  0008 3fcc 0200 0017 0000 001f 0000 0008 0003 c6f8 0003 c6f8 00a1 0018 0000 0000 0008 3fec 0200 0017 0000 001f 0000 0008
0130620  0003 c344 0003 c344 00a1 0018 0000 0000 0008 400c 0200 0017 0000 001f 0000 0008 0003 c260 0003 c260 00a1 0018 0000 0000
0130700  0008 402c 0200 0017 0000 001f 0000 0008 0003 c244 0003 c244 00a1 0018 0000 0000 0008 404c 0200 0017 0000 001f 0000 0008
0130760  0002 7ff0 0002 8018 0081 0007 0000 0000 0008 406c 0200 0017 0000 001f 0000 0008 0002 8068 0002 8114 0081 0007 0000 0000
0131040  0008 408c 0200 0017 0000 001f 0000 0008 0003 c714 0003 c714 00a1 0018 0000 0000 0008 40ac 0200 0017 0000 001f 0000 0008
```

```
0131120 0003 631c 0003 635c 0081 0012 0000 0000 0008 40cc 0200 0017 0000 001f 0000 0008 0005 61cc 0005 61cc 0081 0034 0000 0000
0131200 0008 40ec 0200 0017 0000 001f 0000 0008 0003 9ac4 0003 9ac4 0081 0016 0000 0000 0008 410c 0200 0017 0000 001f 0000 0008
0131260 0002 cca4 0002 cca4 0081 000c 0000 0000 0008 412c 0200 0017 0000 001f 0000 0008 0002 cc48 0002 cc48 0081 000c 0000 0000
0131340 0008 414c 0200 0017 0000 001f 0000 0008 0005 80b4 0005 8110 0081 0035 0000 0000 0008 416c 0200 0017 0000 001f 0000 0008
0131420 0003 7c48 0003 7cc8 0081 0014 0000 0000 0008 418c 0200 0017 0000 001f 0000 0008 0002 5380 0002 5440 0081 0003 0000 0000
0131500 0008 41ac 0200 0017 0000 001f 0000 0008 0005 2208 0005 2208 0081 0030 0000 0000 0008 41cc 0200 0017 0000 001f 0000 0008
0131560 0004 39bc 0004 3a44 0081 0026 0000 0000 0008 41ec 0200 0017 0000 001f 0000 0008 0005 34bc 0005 34bc 0081 0030 0000 0000
0131640 0008 420c 0200 0017 0000 001f 0000 0008 0003 ca50 0003 ca50 00a1 0018 0000 0000 0008 422c 0200 0017 0000 001f 0000 0008
0131720 0003 ca88 0003 ca88 00a1 0018 0000 0000 0008 424c 0200 0017 0000 001f 0000 0008 0003 c90c 0003 c90c 00a1 0018 0000 0000
0132000 0008 426c 0200 0017 0000 0027 0000 0008 0004 6fe8 0004 7044 0081 0029 0000 0000 0008 428c 0200 0017 0000 001f 0000 0008
0132060 0002 a324 0002 a324 0081 000a 0000 0000 0008 42ac 0200 0017 0000 001f 0000 0008 0004 3be4 0004 3c48 0081 0026 0000 0000
0132140 0008 42cc 0200 0017 0000 001f 0000 0008 0004 3b44 0004 3ba8 0081 0026 0000 0000 0008 42ec 0200 0017 0000 001f 0000 0008
0132220 0003 8980 0003 89a8 0081 0014 0000 0000 0008 430c 0200 0017 0000 001f 0000 0008 0004 0ad0 0004 0ad0 0081 0020 0000 0000
0132300 0008 432c 0200 0017 0000 001f 0000 0008 0005 7b78 0005 7bb0 0081 0035 0000 0000 0008 434c 0200 0017 0000 001f 0000 0008
0132360 0003 7814 0003 7814 0081 0014 0000 0000 0008 436c 0200 0017 0000 001f 0000 0008 0003 55cc 0003 55cc 0081 0012 0000 0000
0132440 0008 438c 0200 0017 0000 001f 0000 0008 0003 2170 0003 2170 0081 0010 0000 0000 0008 43ac 0200 0017 0000 001f 0000 0008
0132520 0004 a0cc 0004 a114 0081 002a 0000 0000 0008 43cc 0200 0017 0000 001f 0000 0008 0004 a008 0004 a050 0081 002a 0000 0000
0132600 0008 43ec 0200 0017 0000 001f 0000 0008 0004 a138 0004 a180 0081 002a 0000 0000 0008 440c 0200 0017 0000 001f 0000 0008
0132660 0003 8ef8 0003 8f24 0081 0014 0000 0000 0008 442c 0200 0017 0000 0027 0000 0008 0003 18d8 0003 18f8 0081 000f 0000 0000
0132740 0008 444c 0200 0017 0000 001f 0000 0008 0003 c620 0003 c620 00a1 0018 0000 0000 0008 446c 0200 0017 0000 001f 0000 0008
0133020 0003 a22c 0003 a23c 0081 0017 0000 0000 0008 448c 0200 0017 0000 001f 0000 0008 0004 9ad0 0004 9af0 0081 002a 0000 0000
0133100 0008 44ac 0200 0017 0000 001f 0000 0008 0004 5a04 0004 5ab4 0081 0028 0000 0000 0008 44cc 0200 0017 0000 001f 0000 0008
0133160 0003 653c 0003 6560 0081 0012 0000 0000 0008 44ec 0200 0017 0000 001f 0000 0008 0004 5d5c 0004 5d5c 0081 0028 0000 0000
0133240 0008 450c 0200 0017 0000 001f 0000 0008 0004 f9e0 0004 fa40 0081 0030 0000 0000 0008 452c 0200 0017 0000 001f 0000 0008
0133320 0002 cb64 0002 cb64 0081 000c 0000 0000 0008 454c 0200 0017 0000 001f 0000 0008 0004 aba0 0004 abb8 0081 002d 0000 0000
0133400 0008 456c 0200 0017 0000 001f 0000 0008 0004 a434 0004 ae0c 0081 002d 0000 0000 0008 458c 0200 0017 0000 001f 0000 0008
0133460 0004 24ec 0004 24ec 0081 0024 0000 0000 0008 45ac 0200 0017 0000 001f 0000 0008 0003 fba8 0003 fc20 0081 001e 0000 0000
0133540 0008 45cc 0200 0017 0000 001f 0000 0008 0004 b04c 0004 b0a0 0081 0024 0000 0000 0008 45ec 0200 0017 0000 002f 0000 0008
0133620 0005 8d14 0005 8d60 0081 0037 0000 0000 0008 460c 0200 0017 0000 001f 0000 0008 0003 a2c8 0003 a33c 0081 0017 0000 0000
0133700 0008 462c 0200 0017 0000 001f 0000 0008 0003 ac10 0003 ac50 0081 0017 0000 0000 0008 464c 0200 0017 0000 001f 0000 0008
0133760 0002 a280 0002 a280 0081 0009 0000 0000 0008 466c 0200 0017 0000 001f 0000 0008 0004 255c 0004 255c 0081 0024 0000 0000
0134040 0008 468c 0200 0017 0000 001f 0000 0008 0003 34fc 0003 34fc 0081 0010 0000 0000 0008 46ac 0200 0017 0000 001f 0000 0008
0134120 0003 5b68 0003 5b94 0081 0012 0000 0000 0008 46cc 0200 0017 0000 001f 0000 0008 0003 c5c4 0003 c5c4 00a1 0018 0000 0000
0134200 0008 46ec 0200 0017 0000 001f 0000 0008 0003 4bdc 0003 4c54 0081 0012 0000 0000 0008 470c 0200 0017 0000 001f 0000 0008
0134260 0003 4d58 0003 4d58 0081 0012 0000 0000 0008 472c 0200 0017 0000 001f 0000 0008 0003 5c70 0003 5c70 0081 0012 0000 0000
0134340 0008 474c 0200 0017 0000 001f 0000 0008 0005 3754 0005 3754 0081 0030 0000 0000 0008 476c 0200 0017 0000 001f 0000 0008
0134420 0003 ecec 0003 ecec 0081 001c 0000 0000 0008 478c 0200 0017 0000 001f 0000 0008 0005 7bc8 0005 7c00 0081 0035 0000 0000
0134500 0008 47ac 0200 0017 0000 001f 0000 0008 0003 a0c0 0003 a0c0 0081 0017 0000 0000 0008 47cc 0200 0017 0000 001f 0000 0008
0134560 0003 531c 0003 5330 0081 0012 0000 0000 0008 47ec 0200 0017 0000 001f 0000 0008 0002 5590 0002 55b0 0081 0003 0000 0000
0134640 0008 480c 0200 0017 0000 0027 0000 0008 0004 8e20 0004 8e60 0081 0029 0000 0000 0008 482c 0200 0017 0000 0027 0000 0008
0134720 0004 8e6c 0004 8e6c 0081 0029 0000 0000 0008 484c 0200 0017 0000 0027 0000 0008 0004 8f20 0004 8f20 0081 0029 0000 0000
0135000 0008 486c 0200 0017 0000 0027 0000 0008 0004 8fa4 0004 8fa4 0081 0029 0000 0000 0008 488c 0200 0017 0000 001f 0000 0008
0135060 0005 0ed0 0005 0ed0 0081 0030 0000 0000 0008 48ac 0200 0017 0000 001f 0000 0008 0002 77c8 0002 77c8 0081 0004 0000 0000
0135140 0008 48cc 0200 0017 0000 001f 0000 0008 0003 6234 0003 6234 0081 0012 0000 0000 0008 48ec 0200 0017 0000 001f 0000 0008
0135220 0004 ab18 0004 ab80 0081 002d 0000 0000 0008 490c 0200 0017 0000 0027 0000 0008 0004 8b50 0004 8b50 0081 0029 0000 0000
0135300 0008 492c 0200 0017 0000 0027 0000 0008 0003 0950 0003 0950 0081 000f 0000 0000 0008 494c 0200 0017 0000 001f 0000 0008
0135360 0003 aa78 0003 aa78 0081 0017 0000 0000 0008 496c 0200 0017 0000 001f 0000 0008 0003 ab80 0003 aba8 0081 0017 0000 0000
0135440 0008 498c 0200 0017 0000 001f 0000 0008 0002 a048 0002 a048 0081 0009 0000 0000 0008 49ac 0200 0017 0000 003f 0000 0008
0135520 0005 5d5c 0005 5d5c 0081 0033 0000 0000 0008 49cc 0200 0017 0000 003f 0000 0008 0005 5ea4 0005 5ea4 0081 0033 0000 0000
0135600 0008 49ec 0200 0017 0000 001f 0000 0008 0003 6058 0003 6058 0081 0012 0000 0000 0008 4a0c 0200 0017 0000 001f 0000 0008
0135660 0004 a90c 0004 a90c 00a1 002c 0000 0000 0008 4a2c 0200 0017 0000 0027 0000 0008 0004 80a0 0004 80a0 0081 0029 0000 0000
0135740 0008 4a4c 0200 0017 0000 0027 0000 0008 0004 7f6c 0004 7f6c 0081 0029 0000 0000 0008 4a6c 0200 0017 0000 0027 0000 0008
0136020 0004 8070 0004 808c 0081 0029 0000 0000 0008 4a8c 0200 0017 0000 0027 0000 0008 0004 8050 0004 8050 0081 0029 0000 0000
0136100 0008 4aac 0200 0017 0000 0027 0000 0008 0004 7fa8 0004 7fa8 0081 0029 0000 0000 0008 4acc 0200 0017 0000 0027 0000 0008
0136160 0004 801c 0004 8034 0081 0029 0000 0000 0008 4aec 0200 0017 0000 001f 0000 0008 0004 186c 0004 186c 0081 0023 0000 0000
```

```
0136240 0008 4b0c 0200 0017 0000 001f 0000 0008 0004 1950 0004 1950 0081 0023 0000 0000 0008 4b2c 0200 0017 0000 003f 0000 0008
0136320 0005 5f54 0005 5f54 0081 0033 0000 0000 0008 4b4c 0200 0017 0000 003f 0000 0008 0005 5efc 0005 5efc 0081 0033 0000 0000
0136400 0008 4b6c 0200 0017 0000 001f 0000 0008 0005 4f50 0005 4f8c 0081 0032 0000 0000 0008 4b8c 0200 0017 0000 0027 0000 0008
0136460 0005 880c 0005 880c 0081 0036 0000 0000 0008 4bac 0200 0017 0000 0027 0000 0008 0003 1804 0003 1818 0081 000f 0000 0000
0136540 0008 4bcc 0200 0017 0000 001f 0000 0008 0003 c600 0003 c600 00a1 0018 0000 0000 0008 4bec 0200 0017 0000 001f 0000 0008
0136620 0003 cba0 0003 cba0 00a1 0018 0000 0000 0008 4c0c 0200 0017 0000 001f 0000 0008 0002 c824 0002 c824 0081 000c 0000 0000
0136700 0008 4c2c 0200 0017 0000 001f 0000 0008 0004 bde4 0004 bef8 0081 002f 0000 0000 0008 4c4c 0200 0017 0000 001f 0000 0008
0136760 0004 0ef0 0004 0ef0 0081 0021 0000 0000 0008 4c6c 0200 0017 0000 002f 0000 0008 0005 8b44 0005 8b44 00a1 0036 0000 0000
0137040 0008 4c8c 0200 0017 0000 001f 0000 0008 0003 c4ac 0003 c4ac 00a1 0018 0000 0000 0008 4cac 0200 0017 0000 001f 0000 0008
0137120 0003 c3b4 0003 c3b4 00a1 0018 0000 0000 0008 4ccc 0200 0017 0000 001f 0000 0008 0003 ff70 0003 ff70 0081 001e 0000 0000
0137200 0008 4cec 0200 0017 0000 0027 0000 0008 0004 7ec8 0004 7ec8 0081 0029 0000 0000 0008 4d0c 0200 0017 0000 001f 0000 0008
0137260 0005 1b1c 0005 1b1c 0081 0033 0000 0000 0008 4d2c 0200 0017 0000 001f 0000 0008 0004 3eb0 0004 3eb0 0081 0026 0000 0000
0137340 0008 4d4c 0200 0017 0000 0027 0000 0008 0004 8228 0004 8268 0081 0029 0000 0000 0008 4d6c 0200 0017 0000 0027 0000 0008
0137420 0004 8288 0004 830c 0081 0029 0000 0000 0008 4d8c 0200 0017 0000 0027 0000 0008 0004 832c 0004 839c 0081 0029 0000 0000
0137500 0008 4dac 0200 0017 0000 0027 0000 0008 0004 8184 0004 8208 0081 0029 0000 0000 0008 4dcc 0200 0017 0000 001f 0000 0008
0137560 0003 828c 0003 8298 0081 0014 0000 0000 0008 4dec 0200 0017 0000 0037 0000 0008 0002 d498 0002 d498 0081 000d 0000 0000
0137640 0008 4e0c 0200 0017 0000 0037 0000 0008 0002 d424 0002 d480 0081 000d 0000 0000 0008 4e2c 0200 0017 0000 001f 0000 0008
0137720 0004 ea18 0004 ea8c 0081 0030 0000 0000 0008 4e4c 0200 0017 0000 001f 0000 0008 0004 137c 0004 13e8 0081 0023 0000 0000
0140000 0008 4e6c 0200 0017 0000 001f 0000 0008 0003 a7f8 0003 a7f8 0081 0017 0000 0000 0008 4e8c 0200 0017 0000 001f 0000 0008
0140060 0005 0e20 0005 0e20 0081 0030 0000 0000 0008 4eac 0200 0017 0000 001f 0000 0008 0003 caa4 0003 caa4 00a1 0018 0000 0000
0140140 0008 4ecc 0200 0017 0000 001f 0000 0008 0004 9e90 0004 9ec8 0081 002a 0000 0000 0008 4eec 0200 0017 0000 003f 0000 0008
0140220 0005 63c0 0005 63c0 0081 0033 0000 0000 0008 4f0c 0200 0017 0000 001f 0000 0008 0004 a340 0004 a340 0081 002b 0000 0000
0140300 0008 4f2c 0200 0017 0000 001f 0000 0008 0004 2898 0004 2898 0081 0024 0000 0000 0008 4f4c 0200 0017 0000 001f 0000 0008
0140360 0003 54d0 0003 54d0 0081 0012 0000 0000 0008 4f6c 0200 0017 0000 001f 0000 0008 0003 6d30 0003 6d44 0081 0012 0000 0000
0140440 0008 4f8c 0200 0017 0000 001f 0000 0008 0003 c51c 0003 c51c 00a1 0018 0000 0000 0008 4fac 0200 0017 0000 003f 0000 0008
0140520 0005 5ebc 0005 5ebc 0081 0033 0000 0000 0008 4fcc 0200 0017 0000 001f 0000 0008 0004 e2a4 0004 e2c0 0081 0030 0000 0000
0140600 0008 4fec 0200 0017 0000 001f 0000 0008 0003 7920 0003 7920 0081 0014 0000 0000 0008 500c 0200 0017 0000 001f 0000 0008
0140660 0005 7f08 0005 7f08 0081 0035 0000 0000 0008 502c 0200 0017 0000 001f 0000 0008 0005 7e48 0005 7ea4 0081 0035 0000 0000
0140740 0008 504c 0200 0017 0000 001f 0000 0008 0004 359c 0004 359c 0081 0025 0000 0000 0008 506c 0200 0017 0000 001f 0000 0008
0141020 0002 4e0c 0002 4e2c 0081 0002 0000 0000 0008 508c 0200 0017 0000 001f 0000 0008 0004 f53c 0004 f53c 0081 0030 0000 0000
0141100 0008 50ac 0200 0017 0000 001f 0000 0008 0002 4e54 0002 4e74 0081 0002 0000 0000 0008 50cc 0200 0017 0000 0027 0000 0008
0141160 0004 6f80 0004 6fdc 0081 0029 0000 0000 0008 50ec 0200 0017 0000 001f 0000 0008 0002 a9e4 0002 aa2c 0081 000a 0000 0000
0141240 0008 510c 0200 0017 0000 001f 0000 0008 0005 852c 0005 852c 0081 0035 0000 0000 0008 512c 0200 0017 0000 001f 0000 0008
0141320 0004 201c 0004 20c4 0081 0023 0000 0000 0008 514c 0200 0017 0000 001f 0000 0008 0003 823c 0003 8250 0081 0014 0000 0000
0141400 0008 516c 0200 0017 0000 001f 0000 0008 0004 a928 0004 a928 00a1 002c 0000 0000 0008 518c 0200 0017 0000 001f 0000 0008
0141460 0004 b30c 0004 b30c 0081 002f 0000 0000 0008 51ac 0200 0017 0000 001f 0000 0008 0005 3d4c 0005 3dc4 0081 0031 0000 0000
0141540 0008 51cc 0200 0017 0000 001f 0000 0008 0002 a010 0002 a010 0081 0009 0000 0000 0008 51ec 0200 0017 0000 001f 0000 0008
0141620 0002 97c0 0002 97c0 0081 0009 0000 0000 0008 520c 0200 0017 0000 001f 0000 0008 0002 99a0 0002 99a0 0081 0009 0000 0000
0141700 0008 522c 0200 0017 0000 001f 0000 0008 0002 99c8 0002 99c8 0081 0009 0000 0000 0008 524c 0200 0017 0000 001f 0000 0008
0141760 0002 966c 0002 966c 0081 0009 0000 0000 0008 526c 0200 0017 0000 001f 0000 0008 0002 9b90 0002 9b90 0081 0009 0000 0000
0142040 0008 528c 0200 0017 0000 001f 0000 0008 0002 9c20 0002 9c20 0081 0009 0000 0000 0008 52ac 0200 0017 0000 001f 0000 0008
0142120 0002 83f4 0002 83f4 0081 0009 0000 0000 0008 52cc 0200 0017 0000 001f 0000 0008 0002 8ff8 0002 8ff8 0081 0009 0000 0000
0142200 0008 52ec 0200 0017 0000 001f 0000 0008 0002 9b18 0002 9b18 0081 0009 0000 0000 0008 530c 0200 0017 0000 001f 0000 0008
0142260 0002 9638 0002 9638 0081 0009 0000 0000 0008 532c 0200 0017 0000 001f 0000 0008 0002 9c94 0002 9c94 0081 0009 0000 0000
0142340 0008 534c 0200 0017 0000 001f 0000 0008 0002 9598 0002 9598 0081 0009 0000 0000 0008 536c 0200 0017 0000 001f 0000 0008
0142420 0002 9508 0002 9508 0081 0009 0000 0000 0008 538c 0200 0017 0000 001f 0000 0008 0003 7fa8 0003 7fa8 0081 0014 0000 0000
0142500 0008 53ac 0200 0017 0000 001f 0000 0008 0003 3cf4 0003 3cf4 0081 0011 0000 0000 0008 53cc 0200 0017 0000 001f 0000 0008
0142560 0003 585c 0003 5aec 0081 0012 0000 0000 0008 53ec 0200 0017 0000 001f 0000 0008 0003 d090 0003 d090 0081 001a 0000 0000
0142640 0008 540c 0200 0017 0000 001f 0000 0008 0003 d1fc 0003 d2ac 0081 001a 0000 0000 0008 542c 0200 0017 0000 001f 0000 0008
0142720 0004 b17c 0004 b19c 0081 002d 0000 0000 0008 544c 0200 0017 0000 001f 0000 0008 0005 243c 0005 2510 0081 0030 0000 0000
0143000 0008 546c 0200 0017 0000 001f 0000 0008 0005 9fe4 0005 9fe4 0081 0039 0000 0000 0008 548c 0200 0017 0000 001f 0000 0008
0143060 0002 6324 0002 6324 0081 0003 0000 0000 0008 54ac 0200 0017 0000 0027 0000 0008 0004 6878 0004 68f0 0081 0029 0000 0000
0143140 0008 54cc 0200 0017 0000 0027 0000 0008 0004 72ec 0004 731c 0081 0029 0000 0000 0008 54ec 0200 0017 0000 0027 0000 0008
0143220 0004 69dc 0004 6a1c 0081 0029 0000 0000 0008 550c 0200 0017 0000 001f 0000 0008 0002 cbd0 0002 cbd0 0081 000c 0000 0000
0143300 0008 552c 0200 0017 0000 0027 0000 0008 0004 653c 0004 653c 0081 0029 0000 0000 0008 554c 0200 0017 0000 0027 0000 0008
```

```
0143360  0004 92e8 0004 92e8 0081 0029 0000 0000 0008 556c 0200 0017 0000 001f 0000 0008 0005 7c18 0005 7c50 0081 0035 0000 0000
0143440  0008 558c 0200 0017 0000 0027 0000 0008 0004 6c78 0004 6c78 0081 0029 0000 0000 0008 55ac 0200 0017 0000 0027 0000 0008
0143520  0004 6cb8 0004 6cb8 0081 0029 0000 0000 0008 55cc 0200 0017 0000 001f 0000 0008 0002 84c4 0002 84c4 0081 0008 0000 0000
0143600  0008 55ec 0200 0017 0000 001f 0000 0008 0002 7d08 0002 7d4c 0081 0006 0000 0000 0008 560c 0200 0017 0000 001f 0000 0008
0143660  0003 7b0c 0003 7b40 0081 0014 0000 0000 0008 562c 0200 0017 0000 003f 0000 0008 0005 60f8 0005 60f8 0081 0033 0000 0000
0143740  0008 564c 0200 0017 0000 001f 0000 0008 0005 10fc 0005 10fc 0081 0030 0000 0000 0008 566c 0200 0017 0000 001f 0000 0008
0144020  0002 8358 0002 8358 0081 0008 0000 0000 0008 568c 0200 0017 0000 001f 0000 0008 0005 1894 0005 18a4 0081 0030 0000 0000
0144100  0008 56ac 0200 0017 0000 0027 0000 0008 0005 8a2c 0005 8a2c 0081 0036 0000 0000 0008 56cc 0200 0017 0000 001f 0000 0008
0144160  0004 dfdc 0004 dfdc 0081 0030 0000 0000 0008 56ec 0200 0017 0000 001f 0000 0008 0004 3e08 0004 3e08 0081 0026 0000 0000
0144240  0008 570c 0200 0017 0000 001f 0000 0008 0005 0d50 0005 0d50 0081 0030 0000 0000 0008 572c 0200 0017 0000 002f 0000 0008
0144320  0005 8e8c 0005 8e8c 0081 0037 0000 0000 0008 574c 0200 0017 0000 002f 0000 0008 0005 8ee4 0005 8f28 0081 0037 0000 0000
0144400  0008 576c 0200 0017 0000 0037 0000 0008 0002 f71c 0002 f71c 0081 0003 0000 0000 0008 578c 0200 0017 0000 001f 0000 0008
0144460  0002 4c7c 0002 4c7c 0081 0001 0000 0000 0008 57ac 0200 0017 0000 001f 0000 0008 0002 8284 0002 8284 0081 0008 0000 0000
0144540  0008 57cc 0200 0017 0000 001f 0000 0008 0003 bf4c 0003 bf4c 00a1 0018 0000 0000 0008 57ec 0200 0017 0000 001f 0000 0008
0144620  0003 8a44 0003 8a98 0081 0014 0000 0000 0008 580c 0200 0017 0000 001f 0000 0008 0003 7bcc 0003 7bcc 0081 0014 0000 0000
0144700  0008 582c 0200 0017 0000 001f 0000 0008 0003 82d4 0003 8308 0081 0014 0000 0000 0008 584c 0200 0017 0000 001f 0000 0008
0144760  0003 cb2c 0003 cb2c 00a1 0018 0000 0000 0008 586c 0200 0017 0000 001f 0000 0008 0003 aaa0 0003 aacc 0081 0017 0000 0000
0145040  0008 588c 0200 0017 0000 0027 0000 0008 0004 7b5c 0004 7b5c 0081 0029 0000 0000 0008 58ac 0200 0017 0000 0027 0000 0008
0145120  0004 7ad0 0004 7afc 0081 0029 0000 0000 0008 58cc 0200 0017 0000 001f 0000 0008 0005 0c2c 0005 0c2c 0081 0030 0000 0000
0145200  0008 58ec 0200 0017 0000 001f 0000 0008 0003 393c 0003 39e4 0081 0010 0000 0000 0008 590c 0200 0017 0000 001f 0000 0008
0145260  0005 203c 0005 203c 0081 0030 0000 0000 0008 592c 0200 0017 0000 001f 0000 0008 0003 719c 0003 719c 0081 0012 0000 0000
0145340  0008 594c 0200 0017 0000 001f 0000 0008 0004 d02c 0004 d204 0081 0033 0000 0000 0008 596c 0200 0017 0000 0027 0000 0008
0145420  0003 050c 0003 050c 0081 000f 0000 0000 0008 598c 0200 0017 0000 001f 0000 0008 0004 a09c 0004 a0b8 0081 002a 0000 0000
0145500  0008 59ac 0200 0017 0000 001f 0000 0008 0005 4ee0 0005 4ee0 0081 0032 0000 0000 0008 59cc 0200 0017 0000 001f 0000 0008
0145560  0005 4ef0 0005 4f44 0081 0032 0000 0000 0008 59ec 0200 0017 0000 001f 0000 0008 0005 45c4 0005 45c4 0081 0031 0000 0000
0145640  0008 5a0c 0200 0017 0000 001f 0000 0008 0003 95d8 0003 95d8 0081 0014 0000 0000 0008 5a2c 0200 0017 0000 001f 0000 0008
0145720  0003 a5e0 0003 a608 0081 0017 0000 0000 0008 5a4c 0200 0017 0000 001f 0000 0008 0003 a6e4 0003 a740 0081 0017 0000 0000
0146000  0008 5a6c 0200 0017 0000 001f 0000 0008 0004 af08 0004 afb8 0081 002d 0000 0000 0008 5a8c 0200 0017 0000 001f 0000 0008
0146060  0003 a620 0003 a6d4 0081 0017 0000 0000 0008 5aac 0200 0017 0000 001f 0000 0008 0004 1720 0004 1720 0081 0023 0000 0000
0146140  0008 5acc 0200 0017 0000 001f 0000 0008 0003 65ec 0003 65ec 0081 0012 0000 0000 0008 5aec 0200 0017 0000 001f 0000 0008
0146220  0003 656c 0003 6580 0081 0012 0000 0000 0008 5b0c 0200 0017 0000 001f 0000 0008 0005 0304 0005 0304 0081 0030 0000 0000
0146300  0008 5b2c 0200 0017 0000 001f 0000 0008 0005 03fc 0005 0450 0081 0030 0000 0000 0008 5b4c 0200 0017 0000 001f 0000 0008
0146360  0005 86a4 0005 87e4 0081 0035 0000 0000 0008 5b6c 0200 0017 0000 0027 0000 0008 0004 64d8 0004 6530 0081 0029 0000 0000
0146440  0008 5b9c 0200 0017 0000 003f 0000 0008 0005 59c0 0005 59c0 0081 0033 0000 0000 0008 5bac 0200 0017 0000 003f 0000 0008
0146520  0005 598c 0005 598c 0081 0033 0000 0000 0008 5bcc 0200 0017 0000 001f 0000 0008 0003 c868 0003 c868 00a1 0018 0000 0000
0146600  0008 5bec 0200 0017 0000 001f 0000 0008 0002 528c 0002 528c 0081 0003 0000 0000 0008 5c0c 0200 0017 0000 001f 0000 0008
0146660  0002 5274 0002 5274 0081 0003 0000 0000 0008 5c2c 0200 0017 0000 001f 0000 0008 0002 5888 0002 592c 0081 0003 0000 0000
0146740  0008 5c4c 0200 0017 0000 001f 0000 0008 0002 525c 0002 525c 0081 0003 0000 0000 0008 5c6c 0200 0017 0000 001f 0000 0008
0147020  0003 9db8 0003 91b8 0081 0016 0000 0000 0008 5c8c 0200 0017 0000 003f 0000 0008 0005 6088 0005 6088 0081 0033 0000 0000
0147100  0008 5cac 0200 0017 0000 003f 0000 0008 0005 6018 0005 6018 0081 0033 0000 0000 0008 5ccc 0200 0017 0000 003f 0000 0008
0147160  0005 5fb8 0005 5fb8 0081 0033 0000 0000 0008 5cec 0200 0017 0000 0027 0000 0008 0004 7e78 0004 7e78 0081 0029 0000 0000
0147240  0008 5d0c 0200 0017 0000 001f 0000 0008 0003 9320 0003 9320 0081 0014 0000 0000 0008 5d2c 0200 0017 0000 001f 0000 0008
0147320  0005 131c 0005 131c 0081 0030 0000 0000 0008 5d4c 0200 0017 0000 001f 0000 0008 0003 cfac 0003 d038 0081 001a 0000 0000
0147400  0008 5d6c 0200 0017 0000 001f 0000 0008 0003 caf8 0003 caf8 00a1 0018 0000 0000 0008 5d8c 0200 0017 0000 001f 0000 0008
0147460  0003 90ec 0003 912c 0081 0014 0000 0000 0008 5dac 0200 0017 0000 001f 0000 0008 0002 aa38 0002 aa38 0081 000a 0000 0000
0147540  0008 5dcc 0200 0017 0000 001f 0000 0008 0004 130c 0004 1350 0081 0023 0000 0000 0008 5dec 0200 0017 0000 001f 0000 0008
0147620  0003 cbf8 0003 cbf8 00a1 0018 0000 0000 0008 5e0c 0200 0017 0000 001f 0000 0008 0003 7140 0003 718c 0081 0012 0000 0000
0147700  0008 5e2c 0200 0017 0000 001f 0000 0008 0003 f550 0003 f550 0081 001c 0000 0000 0008 5e4c 0300 0017 0000 001f 0000 000c
0147760  0004 4434 0004 4474 0081 0027 0000 0000 0008 5e6c 0300 0017 0000 001f 0000 000c 0004 45a0 0004 45a0 0081 0027 0000 0000
0150040  0008 5e8c 0300 0017 0000 001f 0000 000c 0004 4b9c 0004 4b9c 0081 0027 0000 0000 0008 5eac 0300 0017 0000 001f 0000 000c
0150120  0004 5354 0004 5354 0081 0027 0000 0000 0008 5ecc 0300 0017 0000 0037 0000 000c 0002 f588 0002 f5d0 0081 000d 0000 0000
0150200  0008 5eec 0300 0017 0000 0037 0000 000c 0002 f5f8 0002 f630 0081 000d 0000 0000 0008 5f0c 0300 0017 0000 001f 0000 000c
0150260  0004 4af0 0004 4b30 0081 0027 0000 0000 0008 5f2c 0300 0017 0000 001f 0000 000c 0004 2e44 0004 2e44 0081 0025 0000 0000
0150340  0008 5f4c 0300 0017 0000 001f 0000 000c 0002 6c40 0002 6c40 0081 0003 0000 0000 0008 5f6c 0300 0017 0000 0027 0000 000c
0150420  0004 917c 0004 917c 0081 0029 0000 0000 0008 5f8c 0300 0017 0000 001f 0000 000c 0005 1638 0005 1680 0081 0030 0000 0000
```

```
0150500  0008 5fac 0300 0017 0000 001f 0000 000c 0005 168c 0005 16d8 0081 0030 0000 0000 0008 5fcc 0300 0017 0000 001f 0000 000c
0150560  0004 210c 0004 2140 0081 0024 0000 0000 0008 5fec 0300 0017 0000 001f 0000 000c 0005 8240 0005 8270 0081 0035 0000 0000
0150640  0008 600c 0300 0017 0000 002f 0000 000c 0005 9384 0005 9384 0081 0037 0000 0000 0008 602c 0300 0017 0000 002f 0000 000c
0150720  0005 9220 0005 924c 0081 0037 0000 0000 0008 604c 0300 0017 0000 002f 0000 000c 0005 9474 0005 948c 0081 0037 0000 0000
0151000  0008 606c 0300 0017 0000 001f 0000 000c 0002 6a34 0002 6a7c 0081 0003 0000 0000 0008 608c 0300 0017 0000 001f 0000 000c
0151060  0002 7118 0002 7119 0081 0003 0000 0000 0008 60ac 0300 0017 0000 001f 0000 000c 0002 7168 0002 7168 0081 0003 0000 0000
0151140  0008 60cc 0300 0017 0000 001f 0000 000c 0005 2b70 0005 2bd4 0081 0030 0000 0000 0008 60ec 0300 0017 0000 001f 0000 000c
0151220  0004 282c 0004 282c 0081 0024 0000 0000 0008 610c 0300 0017 0000 0027 0000 000c 0003 1858 0003 18ac 0081 000f 0000 0000
0151300  0008 612c 0300 0017 0000 0027 0000 000c 0003 198c 0003 199c 0081 000f 0000 0000 0008 614c 0300 0017 0000 001f 0000 000c
0151360  0003 cb48 0003 cb48 00a1 0018 0000 0000 0008 616c 0300 0017 0000 001f 0000 000c 0004 c9e4 0004 c9e4 0081 0030 0000 0000
0151440  0008 618c 0300 0017 0000 001f 0000 000c 0003 3adc 0003 3af8 0081 0010 0000 0000 0008 61ac 0300 0017 0000 001f 0000 000c
0151520  0004 ac90 0004 acbc 0081 002d 0000 0000 0008 61cc 0300 0017 0000 001f 0000 000c 0002 70b8 0002 70b8 0081 0003 0000 0000
0151600  0008 61ec 0300 0017 0000 001f 0000 000c 0004 e8b4 0004 e8b4 0081 0030 0000 0000 0008 620c 0300 0017 0000 0027 0000 000c
0151660  0004 8db4 0004 8db4 0081 0029 0000 0000 0008 622c 0300 0017 0000 001f 0000 000c 0004 cfcc 0004 d014 0081 0030 0000 0000
0151740  0008 624c 0300 0017 0000 001f 0000 000c 0004 2364 0004 2364 0081 0024 0000 0000 0008 626c 0300 0017 0000 001f 0000 000c
0152020  0004 3280 0004 3280 0081 0025 0000 0000 0008 628c 0300 0017 0000 001f 0000 000c 0004 2c98 0004 2df4 0081 0025 0000 0000
0152100  0008 62ac 0300 0017 0000 001f 0000 000c 0004 316c 0004 316c 0081 0025 0000 0000 0008 62cc 0300 0017 0000 001f 0000 000c
0152160  0004 2f1c 0004 30dc 0081 0025 0000 0000 0008 62ec 0300 0017 0000 001f 0000 000c 0004 2eb8 0004 2f10 0081 0025 0000 0000
0152240  0008 630c 0300 0017 0000 001f 0000 000c 0004 127c 0004 12d8 0081 0023 0000 0000 0008 632c 0300 0017 0000 001f 0000 000c
0152320  0004 16ac 0004 16f4 0081 0023 0000 0000 0008 634c 0300 0017 0000 001f 0000 000c 0004 141c 0004 141c 0081 0023 0000 0000
0152400  0008 636c 0300 0017 0000 001f 0000 000c 0004 177c 0004 184c 0081 0023 0000 0000 0008 638c 0300 0017 0000 001f 0000 000c
0152460  0003 cbd8 0003 cbd8 00a1 0018 0000 0000 0008 63ac 0300 0017 0000 001f 0000 000c 0005 3390 0005 3438 0081 0030 0000 0000
0152540  0008 63cc 0300 0017 0000 001f 0000 000c 0003 60ac 0003 6134 0081 0012 0000 0000 0008 63ec 0300 0017 0000 001f 0000 000c
0152620  0005 3454 0005 349c 0081 0030 0000 0000 0008 640c 0300 0017 0000 0037 0000 000c 0002 f778 0002 f7b0 0081 000d 0000 0000
0152700  0008 642c 0300 0017 0000 001f 0000 000c 0003 c9b0 0003 c9b0 00a1 0018 0000 0000 0008 644c 0300 0017 0000 001f 0000 000c
0152760  0003 cf44 0003 cf5c 0081 001a 0000 0000 0008 646c 0300 0017 0000 002f 0000 000c 0005 95e4 0005 95e4 0081 0037 0000 0000
0153040  0008 648c 0300 0017 0000 001f 0000 000c 0003 c82c 0003 c82c 00a1 0018 0000 0000 0008 64ac 0300 0017 0000 001f 0000 000c
0153120  0003 c80c 0003 c90c 00a1 0018 0000 0000 0008 64cc 0300 0017 0000 001f 0000 000c 0004 bbb0 0004 bbb0 0081 002f 0000 0000
0153200  0008 64ec 0300 0017 0000 001f 0000 000c 0004 06cc 0004 0769 0081 0020 0000 0000 0008 650c 0300 0017 0000 001f 0000 000c
0153260  0002 8550 0002 8550 0081 0008 0000 0000 0008 652c 0300 0017 0000 001f 0000 000c 0002 84d4 0002 84d4 0081 0008 0000 0000
0153340  0008 654c 0300 0017 0000 001f 0000 000c 0005 37e0 0005 37e0 0081 0030 0000 0000 0008 656c 0300 0017 0000 001f 0000 000c
0153420  0005 8298 0005 8298 0081 0035 0000 0000 0008 658c 0300 0017 0000 001f 0000 000c 0003 1d64 0003 1d90 0081 0010 0000 0000
0153500  0008 65ac 0300 0017 0000 001f 0000 000c 0003 3300 0003 3309 0081 0010 0000 0000 0008 65cc 0300 0017 0000 001f 0000 000c
0153560  0003 255c 0003 255c 0081 0010 0000 0000 0008 65ec 0300 0017 0000 001f 0000 000c 0005 5234 0005 55b8 0081 0032 0000 0000
0153640  0008 660c 0300 0017 0000 001f 0000 000c 0005 51c8 0005 51c8 0081 0032 0000 0000 0008 662c 0300 0017 0000 001f 0000 000c
0153720  0005 5210 0005 5210 0081 0032 0000 0000 0008 664c 0300 0017 0000 001f 0000 000c 0005 5090 0005 5090 0081 0032 0000 0000
0154000  0008 666c 0300 0017 0000 0027 0000 000c 0004 8548 0004 8570 0081 0029 0000 0000 0008 668c 0300 0017 0000 0027 0000 000c
0154060  0004 8740 0004 8740 0081 0029 0000 0000 0008 66ac 0300 0017 0000 0027 0000 000c 0004 861c 0004 8670 0081 0029 0000 0000
0154140  0008 66cc 0300 0017 0000 001f 0000 000c 0002 596c 0002 59b4 0081 0003 0000 0000 0008 66ec 0300 0017 0000 001f 0000 000c
0154220  0005 4e68 0005 4e68 0081 0032 0000 0000 0008 670c 0300 0017 0000 001f 0000 000c 0003 d024 0003 d024 0081 001a 0000 0000
0154300  0008 672c 0300 0017 0000 001f 0000 000c 0003 4318 0003 449c 0081 0011 0000 0000 0008 674c 0300 0017 0000 001f 0000 000c
0154360  0003 ca10 0003 ca10 00a1 0018 0000 0000 0008 676c 0300 0017 0000 001f 0000 000c 0002 c4d8 0002 c518 0081 000c 0000 0000
0154440  0008 678c 0300 0017 0000 001f 0000 000c 0003 e78c 0003 e78c 0081 001b 0000 0000 0008 67ac 0300 0017 0000 001f 0000 000c
0154520  0005 2288 0005 2288 0081 0030 0000 0000 0008 67cc 0300 0017 0000 001f 0000 000c 0004 e11c 0004 e1bc 0081 0030 0000 0000
0154600  0008 67ec 0300 0017 0000 001f 0000 000c 0003 e6c4 0003 e6c4 0081 001a 0000 0000 0008 680c 0300 0017 0000 001f 0000 000c
0154660  0005 1358 0005 1358 0081 0030 0000 0000 0008 682c 0300 0017 0000 001f 0000 000c 0002 6628 0002 6628 0081 0003 0000 0000
0154740  0008 684c 0300 0017 0000 001f 0000 000c 0002 60e0 0002 60e0 0081 0003 0000 0000 0008 686c 0300 0017 0000 001f 0000 000c
0155020  0003 37b4 0003 37e0 0081 0010 0000 0000 0008 688c 0300 0017 0000 001f 0000 000c 0003 c328 0003 c328 00a1 0018 0000 0000
0155100  0008 68ac 0300 0017 0000 001f 0000 000c 0002 88c4 0002 88c4 0081 0008 0000 0000 0008 68cc 0300 0017 0000 001f 0000 000c
0155160  0002 8850 0002 8850 0081 0008 0000 0000 0008 68ec 0300 0017 0000 001f 0000 000c 0002 8630 0002 8630 0081 0008 0000 0000
0155240  0008 690c 0300 0017 0000 001f 0000 000c 0004 5b1c 0004 5b68 0081 0028 0000 0000 0008 692c 0300 0017 0000 001f 0000 000c
0155320  0003 f010 0003 f010 0081 001c 0000 0000 0008 694c 0300 0017 0000 001f 0000 000c 0003 eed4 0003 eed4 0081 001c 0000 0000
0155400  0008 696c 0300 0017 0000 001f 0000 000c 0005 1918 0005 1964 0081 0030 0000 0000 0008 698c 0300 0017 0000 001f 0000 000c
0155460  0005 4c64 0005 4c64 0081 0031 0000 0000 0008 69ac 0300 0017 0000 001f 0000 000c 0004 1f98 0004 1ff4 0081 0023 0000 0000
0155540  0008 69cc 0300 0017 0000 001f 0000 000c 0003 dd84 0003 de44 0081 001a 0000 0000 0008 69ec 0300 0017 0000 001f 0000 000c
```

```
0155620 0003 dcec 0003 dd68 0081 001a 0000 0000 0008 6a0c 0300 0017 000c 001f 0000 000c 0002 c56c 0002 c598 0081 000c 0000 0000
0155700 0008 6a2c 0300 0017 0000 001f 0000 000c 0002 6150 0002 6150 0081 0003 0000 0000 0008 6a4c 0300 0017 0000 001f 0000 000c
0155760 0004 2608 0004 2678 0081 0024 0000 0000 0008 6a6c 0300 0017 0000 001f 0000 000c 0003 c3ec 0003 c3ec 00a1 0018 0000 0000
0156040 0008 6a8c 0300 0017 0000 001f 0000 000c 0005 74c0 0005 7e1c 0081 0035 0000 0000 0008 6aac 0300 0017 0000 001f 0000 000c
0156120 0002 72b4 0002 72b4 0081 0004 0000 0000 0008 6acc 0300 0017 0000 001f 0000 000c 0002 725c 0002 725c 0081 0004 0000 0000
0156200 0008 6aec 0300 0017 0000 001f 0000 000c 0003 89cc 0003 89cc 0081 0014 0000 0000 0008 6b0c 0300 0017 0000 001f 0000 000c
0156260 0003 8f38 0003 8fc8 0081 0014 0000 0000 0008 6b2c 0300 0017 0000 001f 0000 000c 0005 2184 0005 21f8 0081 0030 0000 0000
0156340 0008 6b4c 0300 0017 0000 001f 0000 000c 0004 4370 0004 4370 0081 0027 0000 0000 0008 6b6c 0300 0017 0000 001f 0000 000c
0156420 0002 a6dc 0002 a7b0 0081 000a 0000 0000 0008 6b8c 0300 0017 0000 001f 0000 000c 0004 2728 0004 2798 0081 0028 0000 0000
0156500 0008 6bac 0300 0017 0000 001f 0000 000c 0003 d514 0003 d514 0081 001a 0000 0000 0008 6bcc 0300 0017 0000 001f 0000 000c
0156560 0003 d4ec 0003 d4ec 0081 001a 0000 0000 0008 6bec 0300 0017 0000 001f 0000 000c 0003 7600 0003 761c 0081 0014 0000 0000
0156640 0008 6c0c 0300 0017 0000 001f 0000 000c 0003 d590 0003 d590 0081 001a 0000 0000 0008 6c2c 0300 0017 0000 001f 0000 000c
0156720 0003 35d0 0003 3610 0081 0010 0000 0000 0008 6c4c 0300 0017 0000 001f 0000 000c 0005 4b74 0005 4b74 0081 0031 0000 0000
0157000 0008 6c6c 0300 0017 0000 001f 0000 000c 0003 c308 0003 c308 00a1 0018 0000 0000 0008 6c8c 0300 0017 0000 001f 0000 000c
0157060 0003 c2e8 0003 c2e8 00a1 0018 0000 0000 0008 6cac 0300 0017 0000 001f 0000 000c 0005 5770 0005 57e4 0081 0032 0000 0000
0157140 0008 6ccc 0300 0017 0000 001f 0000 000c 0005 5614 0005 5614 0081 0032 0000 0000 0008 6cec 0300 0017 0000 001f 0000 000c
0157220 0005 15c8 0005 162c 0081 0030 0000 0000 0008 6d0c 0300 0017 0000 001f 0000 000c 0005 1bec 0005 1ca0 0081 0030 0000 0000
0157300 0008 6d2c 0300 0017 0000 001f 0000 000c 0003 c2c8 0003 c2c8 00a1 0018 0000 0000 0008 6d4c 0300 0017 0000 001f 0000 000c
0157360 0003 c950 0003 c950 00a1 0018 0000 0000 0008 6d6c 0300 0017 0000 002f 0000 000c 0005 8b64 0005 8b64 00a1 0036 0000 0000
0157440 0008 6d8c 0300 0017 0000 001f 0000 000c 0003 c6d4 0003 c6d4 00a1 0018 0000 0000 0008 6dac 0300 0017 0000 001f 0000 000c
0157520 0003 3158 0003 3158 0081 0010 0000 0000 0008 6dcc 0300 0017 0000 001f 0000 000c 0003 2278 0003 2278 0081 0010 0000 0000
0157600 0008 6dec 0300 0017 0000 001f 0000 000c 0005 8128 0005 8128 0081 0035 0000 0000 0008 6e0c 0300 0017 0000 001f 0000 000c
0157660 0003 9e84 0003 9e84 0081 0016 0000 0000 0008 6e2c 0300 0017 0000 001f 0000 000c 0005 5808 0005 5938 0081 0032 0000 0000
0157740 0008 6e4c 0300 0017 0000 001f 0000 000c 0003 1b90 0003 1b90 0081 0010 0000 0000 0008 6e6c 0300 0017 0000 001f 0000 000c
0160020 0003 c1e8 0003 c1e8 00a1 0018 0000 0000 0008 6e8c 0300 0017 0000 001f 0000 000c 0005 51e4 0005 51e4 0081 0032 0000 0000
0160100 0008 6eac 0300 0017 0000 001f 0000 000c 0003 3b48 0003 3b48 0081 0011 0000 0000 0008 6ecc 0300 0017 0000 001f 0000 000c
0160160 0005 08ec 0005 0904 0081 0030 0000 0000 0008 6eec 0300 0017 0000 001f 0000 000c 0002 560c 0002 562c 0081 0003 0000 0000
0160240 0008 6f0c 0300 0017 0000 001f 0000 000c 0003 7e18 0003 7e50 0081 0014 0000 0000 0008 6f2c 0300 0017 0000 001f 0000 000c
0160320 0002 5450 0002 5518 0081 0003 0000 0000 0008 6f4c 0300 0017 0000 001f 0000 000c 0003 cac0 0003 cac0 00a1 0018 0000 0000
0160400 0008 6f6c 0300 0017 0000 001f 0000 000c 0002 a368 0002 a368 0081 000a 0000 0000 0008 6f8c 0300 0017 0000 001f 0000 000c
0160460 0002 a340 0002 a340 0081 000a 0000 0000 0008 6fac 0300 0017 0000 001f 0000 000c 0003 abc0 0003 abc0 0081 0017 0000 0000
0160540 0008 6fcc 0300 0017 0000 001f 0000 000c 0004 fc50 0004 fc9c 0081 0030 0000 0000 0008 6fec 0300 0017 0000 001f 0000 000c
0160620 0002 59f0 0002 5b38 0081 0003 0000 0000 0008 700c 0300 0017 0000 001f 0000 000c 0003 9380 0003 93c4 0081 0014 0000 0000
0160700 0008 702c 0300 0017 0000 001f 0000 000c 0005 2908 0005 2a1c 0081 0030 0000 0000 0008 704c 0300 0017 0000 001f 0000 000c
0160760 0005 105c 0005 10e0 0081 0030 0000 0000 0008 706c 0300 0017 0000 001f 0000 000c 0002 74a4 0002 74ec 0081 0004 0000 0000
0161040 0008 708c 0300 0017 0000 001f 0000 000c 0003 8dd0 0003 8e4c 0081 0014 0000 0000 0008 70ac 0300 0017 0000 0027 0000 000c
0161120 0004 8698 0004 86d0 0081 0029 0000 0000 0008 70cc 0300 0017 0000 001f 0000 000c 0005 0144 0005 01a8 0081 0030 0000 0000
0161200 0008 70ec 0300 0017 0000 001f 0000 000c 0002 a5f0 0002 a6c8 0081 000a 0000 0000 0008 710c 0300 0017 0000 001f 0000 000c
0161260 0004 abdc 0004 ac54 0081 002d 0000 0000 0008 712c 0300 0017 0000 001f 0000 000c 0004 dbb0 0004 dbb0 0081 0030 0000 0000
0161340 0008 714c 0300 0017 0000 001f 0000 000c 0003 ebc8 0003 ebc8 0081 001c 0000 0000 0008 716c 0300 0017 0000 001f 0000 000c
0161420 0004 b0ac 0004 b0f8 0081 002d 0000 0000 0008 718c 0300 0017 0000 001f 0000 000c 0003 ea44 0003 ea9c 0081 001c 0000 0000
0161500 0008 71ac 0300 0017 0000 0037 0000 000c 0002 e5a0 0002 e5a0 0081 000d 0000 0000 0008 71cc 0300 0017 0000 001f 0000 000c
0161560 0005 7700 0005 7718 0081 0035 0000 0000 0008 71ec 0300 0017 0000 001f 0000 000c 0004 225c 0004 2294 0081 0024 0000 0000
0161640 0008 720c 0300 0017 0000 001f 0000 000c 0005 4e4c 0005 4e4c 0081 0032 0000 0000 0008 722c 0300 0017 0000 002f 0000 000c
0161720 0005 8f34 0005 8f34 0081 0037 0000 0000 0008 724c 0300 0017 0000 001f 0000 000c 0003 4ab8 0003 4ab8 0081 0012 0000 0000
0162000 0008 726c 0300 0017 0000 001f 0000 000c 0003 55dc 0003 566c 0081 0012 0000 0000 0008 728c 0300 0017 0000 001f 0000 000c
0162060 0003 56a0 0003 5940 0081 0012 0000 0000 0008 72ac 0300 0017 0000 001f 0000 000c 0003 eda4 0003 eda4 0081 001c 0000 0000
0162140 0008 72cc 0300 0017 0000 001f 0000 000c 0003 e144 0003 ed44 0081 001c 0000 0000 0008 72ec 0300 0017 0000 001f 0000 000c
0162220 0003 a0d8 0003 a0d8 0081 0017 0000 0000 0008 730c 0300 0017 0000 001f 0000 000c 0002 55cc 0002 5600 0081 0003 0000 0000
0162300 0008 732c 0300 0017 0000 001f 0000 000c 0005 1a40 0005 1a98 0081 0030 0000 0000 0008 734c 0300 0017 0000 001f 0000 000c
0162360 0002 76fc 0002 7744 0081 0004 0000 0000 0008 736c 0300 0017 0000 001f 0000 000c 0002 6ca8 0002 6ca8 0081 0003 0000 0000
0162440 0008 738c 0300 0017 0000 001f 0000 000c 0005 4fd0 0005 4fd0 0081 0032 0000 0000 0008 73ac 0300 0017 0000 001f 0000 000c
0162520 0003 30dc 0003 30dc 0081 0010 0000 0000 0008 73cc 0300 0017 0000 003f 0000 000c 0005 5b2c 0005 5b2c 0081 0033 0000 0000
0162600 0008 73ec 0300 0017 0000 001f 0000 000c 0003 21f4 0003 21f4 0081 0010 0000 0000 0008 740c 0300 0017 0000 001f 0000 000c
0162660 0005 20ec 0005 20ec 0081 0030 0000 0000 0008 742c 0300 0017 0000 0027 0000 000c 0004 80c4 0004 80c4 0081 0029 0000 0000
```

```
0162740 0008 744c 0300 0017 0000 001f 0000 000c 0005 01b4 0005 0250 0081 0030 0000 0000 0008 746c 0300 0017 0000 001f 0000 000c
0163020 0004 2308 0004 2350 0081 0024 0000 0000 0008 748c 0300 0017 0000 001f 0000 000c 0003 9610 0003 9660 0081 0014 0000 0000
0163100 0008 74ac 0300 0017 0000 001f 0000 000c 0004 fcc4 0004 fd2c 0081 0030 0000 0000 0008 74cc 0300 0017 0000 001f 0000 000c
0163160 0003 7734 0003 7734 0081 0014 0000 0000 0008 74ec 0300 0017 0000 001f 0000 000c 0005 3b68 0005 3bfc 0081 0031 0000 0000
0163240 0008 750c 0300 0017 0000 001f 0000 000c 0005 184c 0005 1860 0081 0030 0000 0000 0008 752c 0300 0017 0000 001f 0000 000c
0163320 0003 c37c 0003 c37c 00a1 0018 0000 0000 0008 754c 0300 0017 0000 001f 0000 000c 0002 a390 0002 a390 0081 000a 0000 0000
0163400 0008 756c 0300 0017 0000 001f 0000 000c 0005 1b2c 0005 1b2c 0081 0030 0000 0000 0008 758c 0300 0017 0000 001f 0000 000c
0163460 0005 27d0 0005 287c 0081 0030 0000 0000 0008 75ac 0300 0017 0000 001f 0000 000c 0003 c140 0003 c140 00a1 0018 0000 0000
0163540 0008 75cc 0300 0017 0000 001f 0000 000c 0004 1dd4 0004 1e78 0081 0023 0000 0000 0008 75ec 0300 0017 0000 001f 0000 000c
0163620 0004 1e88 0004 1ee0 0081 0023 0000 0000 0008 760c 0300 0017 0000 001f 0000 000c 0004 1d1c 0004 1dc0 0081 0023 0000 0000
0163700 0008 762c 0300 0017 0000 001f 0000 000c 0004 1cb4 0004 1d0c 0081 0023 0000 0000 0008 764c 0300 0017 0000 001f 0000 000c
0163760 0003 6f04 0003 6f04 0081 0012 0000 0000 0008 766c 0300 0017 0000 001f 0000 000c 0003 6e10 0003 6ec0 0081 0012 0000 0000
0164040 0008 768c 0300 0017 0000 001f 0000 000c 0005 3f28 0005 3f8c 0081 0031 0000 0000 0008 76ac 0300 0017 0000 001f 0000 000c
0164120 0005 18b4 0005 18b4 0081 0030 0000 0000 0008 76cc 0300 0017 0000 0037 0000 000c 0002 f248 0002 f288 0081 000d 0000 0000
0164200 0008 76ec 0300 0017 0000 003f 0000 000c 0005 5cb8 0005 5cb8 0081 0033 0000 0000 0008 770c 0300 0017 0000 003f 0000 000c
0164260 0005 5c6c 0005 5c6c 0081 0033 0000 0000 0008 772c 0300 0017 0000 001f 0000 000c 0003 5530 0003 5530 0081 0012 0000 0000
0164340 0008 774c 0300 0017 0000 001f 0000 000c 0002 5330 0002 536c 0081 0003 0000 0000 0008 776c 0300 0017 0000 0027 0000 000c
0164420 0004 62ec 0004 62ec 0081 0029 0000 0000 0008 778c 0300 0017 0000 0027 0000 000c 0004 6378 0004 6378 0081 0029 0000 0000
0164500 0008 77ac 0300 0017 0000 001f 0000 000c 0003 bfe0 0003 bfe0 00a1 0018 0000 0000 0008 77cc 0300 0017 0000 003f 0000 000c
0164560 0005 5db8 0005 5db8 0081 0033 0000 0000 0008 77ec 0300 0017 0000 001f 0000 000c 0003 d4c0 0003 d4d4 0081 001a 0000 0000
0164640 0008 780c 0300 0017 0000 001f 0000 000c 0005 9ff0 0005 9ff0 0081 0039 0000 0000 0008 782c 0300 0017 0000 001f 0000 000c
0164720 0004 f2cc 0004 f3a8 0081 0030 0000 0000 0008 784c 0300 0017 0000 001f 0000 000c 0004 f40c 0004 f40c 0081 0030 0000 0000
0165000 0008 786c 0300 0017 0000 001f 0000 000c 0002 aacc 0002 aacc 0081 000b 0000 0000 0008 788c 0300 0017 0000 001f 0000 000c
0165060 0002 a4cc 0002 a40c 0081 000a 0000 0000 0008 78ac 0300 0017 0000 001f 0000 000c 0003 838c 0003 83b0 0081 0014 0000 0000
0165140 0008 78cc 0300 0017 0000 001f 0000 000c 0004 38f0 0004 3934 0081 0026 0000 0000 0008 78ec 0300 0017 0000 001f 0000 000c
0165220 0002 9dbc 0002 9dbc 0081 0009 0000 0000 0008 790c 0300 0017 0000 001f 0000 000c 0002 9f60 0002 9f60 0081 0009 0000 0000
0165300 0008 792c 0300 0017 0000 001f 0000 000c 0002 9944 0002 9944 0081 0009 0000 0000 0008 794c 0300 0017 0000 001f 0000 000c
0165360 0002 9ebc 0002 9ebc 0081 0009 0000 0000 0008 796c 0300 0017 0000 001f 0000 000c 0002 9b50 0002 9b50 0081 0009 0000 0000
0165440 0008 798c 0300 0017 0000 001f 0000 000c 0002 9e6c 0002 9e6c 0081 0009 0000 0000 0008 79ac 0300 0017 0000 001f 0000 000c
0165520 0002 8d90 0002 8d90 0081 0009 0000 0000 0008 79cc 0300 0017 0000 001f 0000 000c 0002 8ca4 0002 8ca4 0081 0009 0000 0000
0165600 0008 79ec 0300 0017 0000 001f 0000 000c 0002 9218 0002 9218 0081 0009 0000 0000 0008 7a0c 0300 0017 0000 001f 0000 000c
0165660 0002 91c4 0002 91c4 0081 0009 0000 0000 0008 7a2c 0300 0017 0000 001f 0000 000c 0002 9260 0002 9260 0081 0009 0000 0000
0165740 0008 7a4c 0300 0017 0000 001f 0000 000c 0002 9540 0002 9540 0081 0009 0000 0000 0008 7a6c 0300 0017 0000 001f 0000 000c
0166020 0002 8990 0002 8990 0081 0009 0000 0000 0008 7a8c 0300 0017 0000 001f 0000 000c 0002 9430 0002 9430 0081 0009 0000 0000
0166100 0008 7aac 0300 0017 0000 001f 0000 000c 0002 9334 0002 9334 0081 0009 0000 0000 0008 7acc 0300 0017 0000 001f 0000 000c
0166160 0003 8004 0003 8004 0081 0014 0000 0000 0008 7aec 0300 0017 0000 001f 0000 000c 0003 3d4c 0003 3df8 0081 0011 0000 0000
0166240 0008 7b0c 0300 0017 0000 001f 0000 000c 0003 81a0 0003 81e0 0081 0014 0000 0000 0008 7b2c 0300 0017 0000 001f 0000 000c
0166320 0002 a8d4 0002 a9d4 0081 000a 0000 0000 0008 7b4c 0300 0017 0000 001f 0000 000c 0003 d0c8 0003 d194 0081 001a 0000 0000
0166400 0008 7b6c 0300 0017 0000 0027 0000 000c 0004 8bbc 0004 8bbc 0081 0029 0000 0000 0008 7b8c 0300 0017 0000 001f 0000 000c
0166460 0005 2888 0005 28f4 0081 0030 0000 0000 0008 7bac 0300 0017 0000 001f 0000 000c 0003 c0e8 0003 c0e8 00a1 0018 0000 0000
0166540 0008 7bcc 0300 0017 0000 001f 0000 000c 0005 0da8 0005 0e0c 0081 0030 0000 0000 0008 7bec 0300 0017 0000 001f 0000 000c
0166620 0003 6804 0003 68dc 0081 0012 0000 0000 0008 7c0c 0300 0017 0000 001f 0000 000c 0005 7a50 0005 7a98 0081 0035 0000 0000
0166700 0008 7c2c 0300 0017 0000 0027 0000 000c 0004 6944 0004 69c8 0081 0029 0000 0000 0008 7c4c 0300 0017 0000 0027 0000 000c
0166760 0004 7288 0004 72e0 0081 0029 0000 0000 0008 7c6c 0300 0017 0000 0027 0000 000c 0004 71e8 0004 727c 0081 0029 0000 0000
0167040 0008 7c8c 0300 0017 0000 0027 0000 000c 0004 6c38 0004 6c38 0081 0029 0000 0000 0008 7cac 0300 0017 0000 0037 0000 000c
0167120 0002 f6ac 0002 f6f4 0081 000d 0000 0000 0008 7ccc 0300 0017 0000 0027 0000 000c 0003 17cc 0003 17f8 0081 000f 0000 0000
0167200 0008 7cec 0300 0017 0000 001f 0000 000c 0002 7da0 0002 7dc8 0081 0006 0000 0000 0008 7d0c 0300 0017 0000 001f 0000 000c
0167260 0003 2ec4 0003 2f84 0081 0019 0000 0000 0008 7d2c 0300 0017 0000 001f 0000 000c 0002 9cc8 0002 9cc8 0081 0009 0000 0000
0167340 0008 7d4c 0300 0017 0000 001f 0000 000c 0004 dff4 0004 dff4 0081 0030 0000 0000 0008 7d6c 0300 0017 0000 003f 0000 000c
0167420 0005 5acc 0005 5b04 0081 0033 0000 0000 0008 7d8c 0300 0017 0000 003f 0000 000c 0005 613c 0005 613c 0081 0033 0000 0000
0167500 0008 7dac 0300 0017 0000 0037 0000 000c 0002 d36c 0002 d36c 00a1 000c 0000 0000 0008 7dcc 0300 0017 0000 001f 0000 000c
0167560 0002 5654 0002 56c4 0081 0003 0000 0000 0008 7dec 0300 0017 0000 001f 0000 000c 0005 356c 0005 356c 0081 0030 0000 0000
0167640 0008 7e0c 0300 0017 0000 001f 0000 000c 0003 f070 0003 f070 0081 001c 0000 0000 0008 7e2c 0300 0017 0000 001f 0000 000c
0167720 0002 7c7c 0002 7cc0 0081 0006 0000 0000 0008 7e4c 0300 0017 0000 001f 0000 000c 0002 7a9c 0002 7a9c 0081 0006 0000 0000
0170000 0008 7e6c 0300 0017 0000 001f 0000 000c 0005 0f80 0005 0f80 0081 0030 0000 0000 0008 7e8c 0300 0017 0000 001f 0000 000c
```

```
0170060  0005 3a0c 0005 3a0c 0081 0031 0000 0000 0008 7eac 0300 0017 0000 001f 0000 000c 0005 4f98 0005 4f98 0081 0032 0000 0000
0170140  0008 7ecc 0300 0017 0000 001f 0000 000c 0003 7abc 0003 7af8 0081 0014 0000 0000 0008 7eec 0300 0017 0000 001f 0000 000c
0170220  0005 09b4 0005 0a00 0081 0030 0000 0000 0008 7f0c 0300 0017 0000 001f 0000 000c 0002 4d1c 0002 4d1c 0081 0001 0000 0000
0170300  0008 7f2c 0300 0017 0000 001f 0000 000c 0002 4d60 0002 4d60 0081 0001 0000 0000 0008 7f4c 0300 0017 0000 001f 0000 000c
0170360  0003 c020 0003 c020 00a1 0018 0000 0000 0008 7f6c 0300 0017 0000 001f 0000 000c 0002 5c14 0002 5c14 0081 0003 0000 0000
0170440  0008 7f8c 0300 0017 0000 001f 0000 000c 0005 17dc 0005 1840 0081 0030 0000 0000 0008 7fac 0300 0017 0000 001f 0000 000c
0170520  0003 8e58 0003 8e58 0081 0014 0000 0000 0008 7fcc 0300 0017 0000 002f 0000 000c 0005 8fc8 0005 8fc8 0081 0037 0000 0000
0170600  0008 7fec 0300 0017 0000 001f 0000 000c 0003 77e0 0003 7808 0081 0014 0000 0000 0008 800c 0300 0017 0000 001f 0000 000c
0170660  0003 b550 0003 b550 0081 0017 0000 0000 0008 802c 0300 0017 0000 001f 0000 000c 0003 8514 0003 8514 0081 0014 0000 0000
0170740  0008 804c 0300 0017 0000 001f 0000 000c 0003 8d28 0003 8d60 0081 0014 0000 0000 0008 806c 0300 0017 0000 001f 0000 000c
0171020  0003 ab04 0003 ab04 0081 0017 0000 0000 0008 808c 0300 0017 0000 001f 0000 000c 0003 aa18 0003 aa18 0081 0017 0000 0000
0171100  0008 80ac 0300 0017 0000 001f 0000 000c 0003 a834 0003 a878 0081 0017 0000 0000 0008 80cc 0300 0017 0000 0027 0000 000c
0171160  0004 7b9c 0004 7b9c 0081 0029 0000 0000 0008 80ec 0300 0017 0000 001f 0000 000c 0005 7fdc 0005 800c 0081 0035 0000 0000
0171240  0008 810c 0300 0017 0000 001f 0000 000c 0003 c9d0 0003 c8d0 00a1 0018 0000 0000 0008 812c 0300 0017 0000 002f 0000 000c
0171320  0005 9760 0005 9760 0081 0037 0000 0000 0008 814c 0300 0017 0000 002f 0000 000c 0005 96e4 0005 96e4 0081 0037 0000 0000
0171400  0008 816c 0300 0017 0000 001f 0000 000c 0005 234c 0005 234c 0081 0030 0000 0000 0008 818c 0300 0017 0000 001f 0000 000c
0171460  0004 fd38 0004 fd38 0081 0030 0000 0000 0008 81ac 0300 0017 0000 001f 0000 000c 0004 a8ec 0004 a8ec 00a1 002c 0000 0000
0171540  0008 81cc 0300 0017 0000 001f 0000 000c 0003 47a8 0003 47a8 0081 0011 0000 0000 0008 81ec 0300 0017 0000 001f 0000 000c
0171620  0003 46cc 0003 4720 0081 0011 0000 0000 0008 820c 0300 0017 0000 001f 0000 000c 0005 0460 0005 0554 0081 0030 0000 0000
0171700  0008 822c 0300 0017 0000 001f 0000 000c 0005 050c 0005 060c 0081 0030 0000 0000 0008 824c 0300 0017 0000 001f 0000 000c
0171760  0005 032c 0005 03ec 0081 0030 0000 0000 0008 826c 0300 0017 0000 001f 0000 000c 0002 52a4 0002 52a4 0081 0003 0000 0000
0172040  0008 828c 0300 0017 0000 001f 0000 000c 0002 56dc 0002 5774 0081 0003 0000 0000 0008 82ac 0300 0017 0000 001f 0000 000c
0172120  0003 9488 0003 9496 0081 0014 0000 0000 0008 82cc 0300 0017 0000 001f 0000 000c 0003 0284 0003 02d0 0081 000e 0000 0000
0172200  0008 82ec 0300 0017 0000 001f 0000 000c 0002 8444 0002 84a4 0081 0008 0000 0000 0008 830c 0300 0017 0000 001f 0000 000c
0172260  0003 f1a8 0003 f1bc 0081 001c 0000 0000 0008 832c 0300 0017 0000 001f 0000 000c 0004 1ef4 0004 1f54 0081 0023 0000 0000
0172340  0008 834c 0300 0017 0000 001f 0000 000c 0005 117c 0005 129c 0081 0030 0000 0000 0008 836c 0300 0017 0000 001f 0000 000c
0172420  0003 034c 0003 0384 0081 000e 0000 0000 0008 838c 0300 0017 0000 0027 0000 000c 0004 73b4 0004 73fc 0081 0029 0000 0000
0172500  0008 83ac 0300 0017 0000 001f 0000 000c 0004 383c 0004 383c 0081 0026 0000 0000 0008 83cc 0300 0017 0000 001f 0000 000c
0172560  0003 7ce8 0003 7ce8 0081 0014 0000 0000 0008 83ec 0300 0017 0000 001f 0000 000c 0003 7d44 0003 7d90 0081 0014 0000 0000
0172640  0008 840c 0300 0017 0000 001f 0000 000c 0004 3828 0004 3828 0081 0026 0000 0000 0008 842c 0300 0017 0000 001f 0000 000c
0172720  0003 62b0 0003 62b0 0081 0012 0000 0000 0008 844c 0300 0017 0000 001f 0000 000c 0003 39f4 0003 3a38 0081 0010 0000 0000
0173000  0008 846c 0400 0017 0000 001f 0000 0010 0004 44f8 0004 453c 0081 0027 0000 0000 0008 848c 0400 0017 0000 0037 0000 0010
0173060  0002 e710 0002 e710 0081 000d 0000 0000 0008 84ac 0400 0017 0000 0037 0000 0010 0002 ec04 0002 ec04 0081 000d 0000 0000
0173140  0008 84cc 0400 0017 0000 001f 0000 0010 0004 5654 0004 5654 0081 0027 0000 0000 0008 84ec 0400 0017 0000 001f 0000 0010
0173220  0004 4654 0004 498c 0081 0027 0000 0000 0008 850c 0400 0017 0000 001f 0000 0010 0004 49b8 0004 4ac0 0081 0027 0000 0000
0173300  0008 852c 0400 0017 0000 001f 0000 0010 0002 4518 0002 4580 0081 0001 0000 0000 0008 854c 0400 0017 0000 001f 0000 0010
0173360  0002 4408 0002 44fc 0081 0001 0000 0000 0008 856c 0400 0017 0000 001f 0000 0010 0004 21b8 0004 2208 0081 0024 0000 0000
0173440  0008 858c 0400 0017 0000 001f 0000 0010 0004 2154 0004 21a0 0081 0024 0000 0000 0008 85ac 0400 0017 0000 001f 0000 0010
0173520  0003 b940 0003 b968 0081 0018 0000 0000 0008 85cc 0400 0017 0000 001f 0000 0010 0002 6bbc 0002 6c1c 0081 0003 0000 0000
0173600  0008 85ec 0400 0017 0000 001f 0000 0010 0003 7d9c 0003 7dfc 0081 0014 0000 0000 0008 860c 0400 0017 0000 002f 0000 0010
0173660  0005 9270 0005 92a8 0081 0037 0000 0000 0008 862c 0400 0017 0000 002f 0000 0010 0005 92ec 0005 92ec 0081 0037 0000 0000
0173740  0008 864c 0400 0017 0000 001f 0000 0010 0003 87b0 0003 87b0 0081 0014 0000 0000 0008 866c 0400 0017 0000 001f 0000 0010
0174020  0003 867c 0003 86f0 0081 0014 0000 0000 0008 868c 0400 0017 0000 001f 0000 0010 0004 c7b0 0004 c7b0 0081 0030 0000 0000
0174100  0008 86ac 0400 0017 0000 0027 0000 0010 0004 6a2c 0004 6b00 0081 0029 0000 0000 0008 86cc 0400 0017 0000 001f 0000 0010
0174160  0004 eb4c 0004 eed4 0081 0030 0000 0000 0008 86ec 0400 0017 0000 001f 0000 0010 0004 e478 0004 e69c 0081 0030 0000 0000
0174240  0008 870c 0400 0017 0000 001f 0000 0010 0004 31bc 0004 31e8 0081 0025 0000 0000 0008 872c 0400 0017 0000 0027 0000 0010
0174320  0004 6b14 0004 6b14 0081 0029 0000 0000 0008 874c 0400 0017 0000 001f 0000 0010 0003 a144 0003 a154 0081 0017 0000 0000
0174400  0008 876c 0400 0017 0000 001f 0000 0010 0003 c990 0003 c990 00a1 0018 0000 0000 0008 878c 0400 0017 0000 001f 0000 0010
0174460  0003 d6dc 0003 d6dc 0081 001a 0000 0000 0008 87ac 0400 0017 0000 001f 0000 0010 0003 a40c 0003 a424 0081 0017 0000 0000
0174540  0008 87cc 0400 0017 0000 001f 0000 0010 0004 bbf4 0004 bc8c 0081 002f 0000 0000 0008 87ec 0400 0017 0000 001f 0000 0010
0174620  0004 090c 0004 0924 0081 0020 0000 0000 0008 880c 0400 0017 0000 001f 0000 0010 0002 8600 0002 8600 0081 0008 0000 0000
0174700  0008 882c 0400 0017 0000 001f 0000 0010 0003 c538 0003 c538 00a1 0018 0000 0000 0008 884c 0400 0017 0000 001f 0000 0010
0174760  0003 c560 0003 c560 00a1 0018 0000 0000 0008 886c 0400 0017 0000 001f 0000 0010 0005 51a8 0005 51a8 00a1 0031 0000 0000
0175040  0008 888c 0400 0017 0000 001f 0000 0010 0005 3dd4 0005 3dd4 0081 0031 0000 0000 0008 88ac 0400 0017 0000 0027 0000 0010
0175120  0004 86e8 0004 8730 0081 0029 0000 0000 0008 88cc 0400 0017 0000 001f 0000 0010 0003 95a8 0003 95c8 0081 0014 0000 0000
```

```
0175200 0008 88ec 0400 0017 0000 001f 0000 0010 0002 a1f0 0002 a1f0 0081 0009 0000 0000 0008 890c 0400 0017 0000 001f 0000 0010
0175260 0002 a0d4 0002 a0d4 0081 0009 0000 0000 0008 892c 0400 0017 0000 001f 0000 0010 0002 a148 0002 a148 0081 0009 0000 0000
0175340 0008 894c 0400 0017 0000 001f 0000 0010 0005 0a18 0005 0a18 0081 0030 0000 0000 0008 896c 0400 0017 0000 001f 0000 0010
0175420 0003 53d4 0003 5494 0081 0012 0000 0000 0008 898c 0400 0017 0000 001f 0000 0010 0003 954c 0003 9598 0081 0014 0000 0000
0175500 0008 89ac 0400 0017 0000 001f 0000 0010 0005 85e4 0005 8628 0081 0035 0000 0000 0008 89cc 0400 0017 0000 001f 0000 0010
0175560 0005 8590 0005 8590 0081 0035 0000 0000 0008 89ec 0400 0017 0000 0027 0000 0010 0004 6bdc 0004 6bdc 0081 0029 0000 0000
0175640 0008 8a0c 0400 0017 0000 001f 0000 0010 0003 3714 0003 379c 0081 0010 0000 0000 0008 8a2c 0400 0017 0000 001f 0000 0010
0175720 0002 65b4 0002 65b4 0081 0003 0000 0000 0008 8a4c 0400 0017 0000 001f 0000 0010 0003 3088 0003 3088 0081 0010 0000 0000
0176000 0008 8a6c 0400 0017 0000 002f 0000 0010 0005 8ff8 0005 8ff8 0081 0037 0000 0000 0008 8a8c 0400 0017 0000 001f 0000 0010
0176060 0003 8bec 0003 8c14 0081 0014 0000 0000 0008 8aac 0400 0017 0000 001f 0000 0010 0002 6748 0002 6748 0081 0003 0000 0000
0176140 0008 8acc 0400 0017 0000 001f 0000 0010 0004 dd34 0004 dd48 0081 0030 0000 0000 0008 8aec 0400 0017 0000 001f 0000 0010
0176220 0003 ce3c 0003 ce3c 0081 001a 0000 0000 0008 8b0c 0400 0017 0000 001f 0000 0010 0003 cd44 0003 cd44 0081 001a 0000 0000
0176300 0008 8b2c 0400 0017 0000 001f 0000 0010 0003 2754 0003 2754 0081 0010 0000 0000 0008 8b4c 0400 0017 0000 001f 0000 0010
0176360 0005 4944 0005 4944 0081 0031 0000 0000 0008 8b6c 0400 0017 0000 001f 0000 0010 0003 76e0 0003 7724 0081 0014 0000 0000
0176440 0008 8b8c 0400 0017 0000 001f 0000 0010 0004 afc4 0004 afc4 0081 002d 0000 0000 0008 8bac 0400 0017 0000 001f 0000 0010
0176520 0004 0be0 0004 0be0 0081 0020 0000 0000 0008 8bcc 0400 0017 0000 001f 0000 0010 0002 7a0c 0002 7a7c 0081 0006 0000 0000
0176600 0008 8bec 0400 0017 0000 001f 0000 0010 0004 43a0 0004 43a0 0081 0027 0000 0000 0008 8c0c 0400 0017 0000 001f 0000 0010
0176660 0002 695c 0002 69c0 0081 0003 0000 0000 0008 8c2c 0400 0017 0000 001f 0000 0010 0003 75c4 0003 75f4 0081 0014 0000 0000
0176740 0008 8c4c 0400 0017 0000 001f 0000 0010 0003 7598 0003 75b8 0081 0014 0000 0000 0008 8c6c 0400 0017 0000 001f 0000 0010
0177020 0005 431c 0005 45a8 0081 0031 0000 0000 0008 8c8c 0400 0017 0000 001f 0000 0010 0003 c928 0003 c928 00a1 0018 0000 0000
0177100 0008 8cac 0400 0017 0000 001f 0000 0010 0003 c96c 0003 c96c 00a1 0018 0000 0000 0008 8ccc 0400 0017 0000 001f 0000 0010
0177160 0003 c8ac 0003 c8ac 00a1 0018 0000 0000 0008 8cec 0400 0017 0000 001f 0000 0010 0003 31f0 0003 3204 0081 0010 0000 0000
0177240 0008 8d0c 0400 0017 0000 001f 0000 0010 0002 7fa8 0002 7fa8 0081 0007 0000 0000 0008 8d2c 0400 0017 0000 001f 0000 0010
0177320 0002 8124 0002 8144 0081 0007 0000 0000 0008 8d4c 0400 0017 0000 0037 0000 0010 0002 dd8c 0002 dd9c 0081 000d 0000 0000
0177400 0008 8d6c 0400 0017 0000 001f 0000 0010 0005 814c 0005 8190 0081 0035 0000 0000 0008 8d8c 0400 0017 0000 001f 0000 0010
0177460 0003 c1a0 0003 c1a0 00a1 0018 0000 0000 0008 8dac 0400 0017 0000 001f 0000 0010 0003 1bc4 0003 1bc4 0081 0010 0000 0000
0177540 0008 8dcc 0400 0017 0000 001f 0000 0010 0003 c1c4 0003 c1c4 00a1 0018 0000 0000 0008 8dec 0400 0017 0000 001f 0000 0010
0177620 0005 0770 0005 0770 0081 0030 0000 0000 0008 8e0c 0400 0017 0000 001f 0000 0010 0004 19a4 0004 1acc 0081 0023 0000 0000
0177700 0008 8e2c 0400 0017 0000 001f 0000 0010 0003 8904 0003 8940 0081 0014 0000 0000 0008 8e4c 0400 0017 0000 001f 0000 0010
0177760 0003 783c 0003 7848 0081 0014 0000 0000 0008 8e6c 0400 0017 0000 001f 0000 0010 0005 0124 0005 0124 0081 0030 0000 0000
0200040 0008 8e8c 0400 0017 0000 001f 0000 0010 0003 ac6c 0003 acb8 0081 0017 0000 0000 0008 8eac 0400 0017 0000 001f 0000 0010
0200120 0003 ec00 0003 ec00 0081 001c 0000 0000 0008 8ecc 0400 0017 0000 001f 0000 0010 0003 eb30 0003 eb30 0081 001c 0000 0000
0200200 0008 8eec 0400 0017 0000 0037 0000 0010 0002 e5d8 0002 e618 0081 000d 0000 0000 0008 8f0c 0400 0017 0000 001f 0000 0010
0200260 0003 8bb0 0003 8bc4 0081 0014 0000 0000 0008 8f2c 0400 0017 0000 001f 0000 0010 0003 8b84 0003 8ba4 0081 0014 0000 0000
0200340 0008 8f4c 0400 0017 0000 001f 0000 0010 0003 351c 0003 351c 0081 0010 0000 0000 0008 8f6c 0400 0017 0000 001f 0000 0010
0200420 0003 c888 0003 c888 00a1 0018 0000 0000 0008 8f8c 0400 0017 0000 001f 0000 0010 0003 7578 0003 7578 0081 0014 0000 0000
0200500 0008 8fac 0400 0017 0000 001f 0000 0010 0003 ef1c 0003 ef1c 0081 001c 0000 0000 0008 8fcc 0400 0017 0000 001f 0000 0010
0200560 0003 ede0 0003 ede0 0081 001c 0000 0000 0008 8fec 0400 0017 0000 0027 0000 0010 0004 7cc8 0004 7cc8 0081 0029 0000 0000
0200640 0008 900c 0400 0017 0000 0037 0000 0010 0002 d34c 0002 d34c 00a1 000c 0000 0000 0008 902c 0400 0017 0000 0027 0000 0010
0200720 0003 0b28 0003 0b28 0081 000f 0000 0000 0008 904c 0400 0017 0000 001f 0000 0010 0005 0cec 0005 0d08 0081 0030 0000 0000
0201000 0008 906c 0400 0017 0000 001f 0000 0010 0005 19e0 0005 1a04 0081 0030 0000 0000 0008 908c 0400 0017 0000 001f 0000 0010
0201060 0003 d614 0003 d614 0081 001a 0000 0000 0008 90ac 0400 0017 0000 001f 0000 0010 0005 1d4c 0005 2020 0081 0030 0000 0000
0201140 0008 90cc 0400 0017 0000 001f 0000 0010 0003 7630 0003 7630 0081 0014 0000 0000 0008 90ec 0400 0017 0000 001f 0000 0010
0201220 0003 c640 0003 c640 00a1 0018 0000 0000 0008 910c 0400 0017 0000 001f 0000 0010 0003 bc90 0003 bc90 0081 0018 0000 0000
0201300 0008 912c 0400 0017 0000 0027 0000 0010 0004 6e9c 0004 6e9c 0081 0029 0000 0000 0008 914c 0400 0017 0000 002f 0000 0010
0201360 0005 8e44 0005 8e70 0081 0037 0000 0000 0008 916c 0400 0017 0000 002f 0000 0010 0005 91b0 0005 9238 0081 0037 0000 0000
0201440 0008 918c 0400 0017 0000 001f 0000 0010 0005 2530 0005 2530 0081 0030 0000 0000 0008 91ac 0400 0017 0000 001f 0000 0010
0201520 0003 bf88 0003 bf88 00a1 0018 0000 0000 0008 91cc 0400 0017 0000 001f 0000 0010 0002 a468 0002 a468 0081 000a 0000 0000
0201600 0008 91ec 0400 0017 0000 001f 0000 0010 0002 a3b4 0002 a3b4 0081 000a 0000 0000 0008 920c 0400 0017 0000 001f 0000 0010
0201660 0004 f578 0004 f578 0081 0030 0000 0000 0008 922c 0400 0017 0000 002f 0000 0010 0005 8dcc 0005 8dcc 0081 0037 0000 0000
0201740 0008 924c 0400 0017 0000 001f 0000 0010 0003 f238 0003 f2c4 0081 001c 0000 0000 0008 926c 0400 0017 0000 001f 0000 0010
0202020 0005 1408 0005 1408 0081 0030 0000 0000 0008 928c 0400 0017 0000 0037 0000 0010 0002 f2b8 0002 f2cc 0081 000d 0000 0000
0202100 0008 92ac 0400 0017 0000 001f 0000 0010 0003 b668 0003 b684 0081 0018 0000 0000 0008 92cc 0400 0017 0000 001f 0000 0010
0202160 0003 93d0 0003 9408 0081 0014 0000 0000 0008 92ec 0400 0017 0000 001f 0000 0010 0004 a210 0004 a2b4 0081 002b 0000 0000
0202240 0008 930c 0400 0017 0000 0027 0000 0010 0004 63e4 0004 63e4 0081 0029 0000 0000 0008 932c 0400 0017 0000 001f 0000 0010
```

```
0202320  0003 94ec 0003 953c 0081 0014 0000 0000 0008 934c 0400 0017 0000 001f 0000 0010 0003 f380 0003 f380 0081 001c 0000 0000
0202400  0008 936c 0400 0017 0000 001f 0000 0010 0003 0208 0003 0208 0081 000e 0000 0000 0008 938c 0400 0017 0000 001f 0000 0010
0202460  0002 fff0 0003 0004 0081 000e 0000 0000 0008 93ac 0400 0017 0000 001f 0000 0010 0003 01b0 0003 01b0 0081 000e 0000 0000
0202540  0008 93cc 0400 0017 0000 001f 0000 0010 0003 001c 0003 01a0 0081 000e 0000 0000 0008 93ec 0400 0017 0000 001f 0000 0010
0202620  0005 7f20 0005 7fd0 0081 0035 0000 0000 0008 940c 0400 0017 0000 001f 0000 0010 0004 f7ac 0004 f7ac 0081 0030 0000 0000
0202700  0008 942c 0400 0017 0000 001f 0000 0010 0004 f080 0004 f080 0081 0030 0000 0000 0008 944c 0400 0017 0000 001f 0000 0010
0202760  0004 dd58 0004 dd58 0081 0030 0000 0000 0008 946c 0400 0017 0000 001f 0000 0010 0003 83dc 0003 83dc 0081 0014 0000 0000
0203040  0008 948c 0400 0017 0000 001f 0000 0010 0003 843c 0003 846c 0081 0014 0000 0000 0008 94ac 0400 0017 0000 001f 0000 0010
0203120  0003 8478 0003 8508 0081 0014 0000 0000 0008 94cc 0400 0017 0000 001f 0000 0010 0003 c580 0003 c580 00a1 0018 0000 0000
0203200  0008 94ec 0400 0017 0000 001f 0000 0010 0004 bf08 0004 bfc8 0081 002f 0000 0000 0008 950c 0400 0017 0000 001f 0000 0010
0203260  0002 5e04 0002 5e04 0081 0003 0000 0000 0008 952c 0400 0017 0000 001f 0000 0010 0002 9d58 0002 9d58 0081 0009 0000 0000
0203340  0008 954c 0400 0017 0000 001f 0000 0010 0002 9cf8 0002 9cf8 0081 0009 0000 0000 0008 956c 0400 0017 0000 001f 0000 0010
0203420  0002 9034 0002 9034 0081 0009 0000 0000 0008 958c 0400 0017 0000 001f 0000 0010 0002 8e5c 0002 8e5c 0081 0009 0000 0000
0203500  0008 95ac 0400 0017 0000 001f 0000 0010 0002 8c2c 0002 8c6c 0081 0009 0000 0000 0008 95cc 0400 0017 0000 001f 0000 0010
0203560  0002 894c 0002 894c 0081 0009 0000 0000 0008 95ec 0400 0017 0000 001f 0000 0010 0002 8a38 0002 8a38 0081 0009 0000 0000
0203640  0008 960c 0400 0017 0000 001f 0000 0010 0003 862c 0003 8670 0081 0014 0000 0000 0008 962c 0400 0017 0000 001f 0000 0010
0203720  0003 8700 0003 876c 0081 0014 0000 0000 0008 954c 0400 0017 0000 001f 0000 0010 0003 4dcc 0003 4dcc 0081 0012 0000 0000
0204000  0008 966c 0400 0017 0000 0027 0000 0010 0004 8bd8 0004 9bd8 0081 0029 0000 0000 0008 968c 0400 0017 0000 001f 0000 0010
0204060  0003 c5a0 0003 c5a0 00a1 0018 0000 0000 0008 96ac 0400 0017 0000 001f 0000 0010 0002 68ec 0002 68ec 0081 0003 0000 0000
0204140  0008 96cc 0400 0017 0000 001f 0000 0010 0002 6424 0002 64b0 0081 0003 0000 0000 0008 96ec 0400 0017 0000 001f 0000 0010
0204220  0004 db80 0004 dba0 0081 0030 0000 0000 0008 970c 0400 0017 0000 001f 0000 0010 0002 83b8 0002 83b8 0081 0008 0000 0000
0204300  0008 972c 0400 0017 0000 0037 0000 0010 0002 f39c 0002 f3d4 0081 000d 0000 0000 0008 974c 0400 0017 0000 0037 0000 0010
0204360  0002 f340 0002 f340 0081 000d 0000 0000 0008 976c 0400 0017 0000 0037 0000 0010 0002 f2ec 0002 f2ec 0081 000d 0000 0000
0204440  0008 978c 0400 0017 0000 0037 0000 0010 0002 f438 0002 f470 0081 000d 0000 0000 0008 97ac 0400 0017 0000 001f 0000 0010
0204520  0005 199c 0005 19c0 0081 0030 0000 0000 0008 97cc 0400 0017 0000 001f 0000 0010 0003 f0dc 0003 f138 0081 001c 0000 0000
0204600  0008 97ec 0400 0017 0000 001f 0000 0010 0002 7ac4 0002 7bbc 0081 0006 0000 0000 0008 980c 0400 0017 0000 001f 0000 0010
0204660  0002 7c48 0002 7c48 0081 0006 0000 0000 0008 982c 0400 0017 0000 001f 0000 0010 0004 b570 0004 b570 0081 002f 0000 0000
0204740  0008 984c 0400 0017 0000 002f 0000 0010 0005 90a8 0005 90a8 0081 0037 0000 0000 0008 986c 0400 0017 0000 002f 0000 0010
0205020  0005 9128 0005 9168 0081 0037 0000 0000 0008 988c 0400 0017 0000 001f 0000 0010 0003 7544 0003 7544 0081 0014 0000 0000
0205100  0008 98ac 0400 0017 0000 0037 0000 0010 0002 f024 0002 f09c 0081 000d 0000 0000 0008 98cc 0400 0017 0000 001f 0000 0010
0205160  0003 8318 0003 8358 0081 0014 0000 0000 0008 98ec 0400 0017 0000 001f 0000 0010 0003 8580 0003 85f4 0081 0014 0000 0000
0205240  0008 990c 0400 0017 0000 001f 0000 0010 0003 8c20 0003 8c74 0081 0014 0000 0000 0008 992c 0400 0017 0000 001f 0000 0010
0205320  0005 1974 0005 1974 0081 0030 0000 0000 0008 994c 0400 0017 0000 001f 0000 0010 0005 0910 0005 0944 0081 0030 0000 0000
0205400  0008 996c 0400 0017 0000 001f 0000 0010 0003 708c 0003 708c 0081 0012 0000 0000 0008 998c 0400 0017 0000 001f 0000 0010
0205460  0003 6f74 0003 6f74 0081 0012 0000 0000 0008 99ac 0400 0017 0000 001f 0000 0010 0003 6d84 0003 6db4 0081 0012 0000 0000
0205540  0008 99cc 0400 0017 0000 001f 0000 0010 0003 6fd8 0003 6fd8 0081 0012 0000 0000 0008 99ec 0400 0017 0000 001f 0000 0010
0205620  0003 6dcc 0003 6df8 0081 0012 0000 0000 0008 9a0c 0400 0017 0000 001f 0000 0010 0003 a76c 0003 a76c 0081 0017 0000 0000
0205700  0008 9a2c 0400 0017 0000 001f 0000 0010 0004 a8cc 0004 a8cc 00a1 002c 0000 0000 0008 9a4c 0400 0017 0000 001f 0000 0010
0205760  0003 4734 0003 4734 0081 0011 0000 0000 0008 9a6c 0400 0017 0000 001f 0000 0010 0005 0564 0005 05f8 0081 0030 0000 0000
0206040  0008 9a8c 0400 0017 0000 003f 0000 0010 0005 59f0 0005 59f0 0081 0033 0000 0000 0008 9aac 0400 0017 0000 001f 0000 0010
0206120  0004 30ec 0004 3114 0081 0025 0000 0000 0008 9acc 0400 0017 0000 001f 0000 0010 0002 5798 0002 5830 0081 0003 0000 0000
0206200  0008 9aec 0400 0017 0000 001f 0000 0010 0004 b20c 0004 b20c 0081 002e 0000 0000 0008 9b0c 0400 0017 0000 001f 0000 0010
0206260  0003 f1e0 0003 f1e0 0081 001c 0000 0000 0008 9b2c 0400 0017 0000 001f 0000 0010 0003 02e8 0003 02e8 0081 000e 0000 0000
0206340  0008 9b4c 0400 0017 0000 001f 0000 0010 0004 2c68 0004 2c80 0081 0025 0000 0000 0008 9b6c 0400 0017 0000 0027 0000 0010
0206420  0004 7648 0004 7648 0081 0029 0000 0000 0008 9b8c 0400 0017 0000 001f 0000 0010 0002 461c 0002 4678 0081 0001 0000 0000
0206500  0008 9bac 0500 0017 0000 001f 0000 0014 0003 5ee0 0003 5f50 0081 0012 0000 0000 0008 9bcc 0500 0017 0000 001f 0000 0014
0206560  0004 55fc 0004 55fc 0081 0027 0000 0000 0008 9bec 0500 0017 0000 001f 0000 0014 0005 2dd8 0005 2dd8 0081 0030 0000 0000
0206640  0008 9c0c 0500 0017 0000 001f 0000 0014 0002 ff68 0002 ffd8 0081 000e 0000 0000 0008 9c2c 0500 0017 0000 001f 0000 0014
0206720  0003 80b4 0003 8154 0081 0014 0000 0000 0008 9c4c 0500 0017 0000 0027 0000 0014 0004 5de4 0004 5de4 0081 0029 0000 0000
0207000  0008 9c6c 0500 0017 0000 001f 0000 0014 0004 e734 0004 e734 0081 0030 0000 0000 0008 9c8c 0500 0017 0000 001f 0000 0014
0207060  0004 dae0 0004 dae0 0081 0030 0000 0000 0008 9cac 0500 0017 0000 001f 0000 0014 0004 deb4 0004 dfa8 0081 0030 0000 0000
0207140  0008 9ccc 0500 0017 0000 001f 0000 0014 0004 cd58 0004 cf70 0081 0030 0000 0000 0008 9cec 0500 0017 0000 001f 0000 0014
0207220  0004 d210 0004 dac0 0081 0030 0000 0000 0008 9d0c 0500 0017 0000 001f 0000 0014 0004 e2d8 0004 e418 0081 0030 0000 0000
0207300  0008 9d2c 0500 0017 0000 001f 0000 0014 0004 2428 0004 243c 0081 0024 0000 0000 0008 9d4c 0500 0017 0000 001f 0000 0014
0207360  0003 c9e8 0003 c9e8 00a1 0018 0000 0000 0008 9d6c 0500 0017 0000 001f 0000 0014 0003 d748 0003 dcc0 0081 001a 0000 0000
```

```
0207440  0008 9d8c 0500 0017 0000 001f 0000 0014 0004 bcc4 0004 bcc4 0081 002f 0000 0000 0008 9dac 0500 0017 0000 001f 0000 0014
0207520  0004 0958 0004 09b4 0081 0020 0000 0000 0008 91cc 0500 0017 0000 001f 0000 0014 0004 0820 0004 0900 0081 0020 0000 0000
0207600  0008 9dec 0500 0017 0000 0027 0000 0014 0004 8918 0004 8918 0081 0029 0000 0000 0008 9e0c 0500 0017 0000 0027 0000 0014
0207660  0004 883c 0004 883c 0081 0029 0000 0000 0008 9e2c 0500 0017 0000 0027 0000 0014 0004 7080 0004 7080 0081 0029 0000 0000
0207740  0008 9e4c 0500 0017 0000 001f 0000 0014 0002 ff00 0002 ff54 0081 000e 0000 0000 0008 9e6c 0500 0017 0000 001f 0000 0014
0210020  0004 5848 0004 5da4 0081 0027 0000 0000 0008 9e8c 0500 0017 0000 001f 0000 0014 0002 602c 0002 602c 0081 0003 0000 0000
0210100  0008 9eac 0500 0017 0000 001f 0000 0014 0003 5fec 0003 5fec 0081 0012 0000 0000 0008 9ecc 0500 0017 0000 001f 0000 0014
0210160  0003 7668 0003 7668 0081 0014 0000 0000 0008 9eec 0500 0017 0000 001f 0000 0014 0005 45dc 0005 4634 0081 0031 0000 0000
0210240  0008 9f0c 0500 0017 0000 001f 0000 0014 0005 81b0 0005 81f0 0081 0035 0000 0000 0008 9f2c 0500 0017 0000 001f 0000 0014
0210320  0003 1c00 0003 1c00 0081 0010 0000 0000 0008 9f4c 0500 0017 0000 001f 0000 0014 0003 3ba0 0003 3ba0 0081 0011 0000 0000
0210400  0008 9f6c 0500 0017 0000 001f 0000 0014 0003 880c 0003 88e0 0081 0014 0000 0000 0008 9f8c 0500 0017 0000 001f 0000 0014
0210460  0003 5fa0 0003 5fa0 0081 0012 0000 0000 0008 9fac 0500 0017 0000 001f 0000 0014 0003 9278 0003 92c4 0081 0014 0000 0000
0210540  0008 9fcc 0500 0017 0000 001f 0000 0014 0003 943c 0003 9478 0081 0014 0000 0000 0008 9fec 0500 0017 0000 001f 0000 0014
0210620  0004 dc94 0004 dc94 0081 0030 0000 0000 0008 a00c 0500 0017 0000 001f 0000 0014 0003 eb60 0003 eb60 0081 001c 0000 0000
0210700  0008 a02c 0500 0017 0000 001f 0000 0014 0004 57d0 0004 582c 0081 0027 0000 0000 0008 a04c 0500 0017 0000 001f 0000 0014
0210760  0003 bdfc 0003 bdfc 0081 0018 0000 0000 0008 a06c 0500 0017 0000 002f 0000 0014 0005 8b84 0005 8b84 00a1 0036 0000 0000
0211040  0008 a08c 0500 0017 0000 001f 0000 0014 0002 5b50 0002 5b50 0081 0003 0000 0000 0008 a0ac 0500 0017 0000 001f 0000 0014
0211120  0003 ef84 0003 ef84 0081 001c 0000 0000 0008 a0cc 0500 0017 0000 001f 0000 0014 0003 ee48 0003 ee48 0081 001c 0000 0000
0211200  0008 a0ec 0500 0017 0000 0027 0000 0014 0004 7d0c 0004 7d50 0081 0029 0000 0000 0008 a10c 0500 0017 0000 002f 0000 0014
0211260  0005 985c 0005 9c20 0081 0037 0000 0000 0008 a12c 0500 0017 0000 001f 0000 0014 0004 5744 0004 57a0 0081 0027 0000 0000
0211340  0008 a14c 0500 0017 0000 0027 0000 0014 0003 1530 0003 1530 0081 000f 0000 0000 0008 a16c 0500 0017 0000 001f 0000 0014
0211420  0003 9bdc 0003 9cb8 0081 0016 0000 0000 0008 a18c 0500 0017 0000 001f 0000 0014 0003 9cd4 0003 9d1c 0081 0016 0000 0000
0211500  0008 a1ac 0500 0017 0000 001f 0000 0014 0003 bc04 0003 bc5c 0081 0018 0000 0000 0008 a1cc 0500 0017 0000 001f 0000 0014
0211560  0003 5cc4 0003 5d54 0081 0012 0000 0000 0008 a1ec 0500 0017 0000 001f 0000 0014 0005 25c4 0005 25c4 0081 0030 0000 0000
0211640  0008 a20c 0500 0017 0000 001f 0000 0014 0003 f2f4 0003 f330 0081 001c 0000 0000 0008 a22c 0500 0017 0000 001f 0000 0014
0211720  0004 ea98 0004 ead4 0081 0030 0000 0000 0008 a24c 0500 0017 0000 001f 0000 0014 0003 5e60 0003 5e8c 0081 0012 0000 0000
0212000  0008 a26c 0500 0017 0000 001f 0000 0014 0003 e11c 0003 e11c 0081 001a 0000 0000 0008 a28c 0500 0017 0000 001f 0000 0014
0212060  0002 fe98 0002 fee8 0081 000e 0000 0000 0008 a2ac 0500 0017 0000 001f 0000 0014 0002 a4c8 0002 a50c 0081 000a 0000 0000
0212140  0008 a2cc 0500 0017 0000 001f 0000 0014 0002 8a78 0002 8a78 0081 0009 0000 0000 0008 a2ec 0500 0017 0000 001f 0000 0014
0212220  0003 f148 0003 f194 0081 001c 0000 0000 0008 a30c 0500 0017 0000 001f 0000 0014 0002 7be8 0002 7c28 0081 0006 0000 0000
0212300  0008 a32c 0500 0017 0000 0037 0000 0014 0002 f0c4 0002 f220 0081 000d 0000 0000 0008 a34c 0500 0017 0000 001f 0000 0014
0212360  0003 5278 0003 52d0 0081 0012 0000 0000 0008 a36c 0500 0017 0000 0037 0000 0014 0002 e664 0002 e6d8 0081 000d 0000 0000
0212440  0008 a38c 0500 0017 0000 001f 0000 0014 0004 1ae4 0004 1c24 0081 0023 0000 0000 0008 a3ac 0500 0017 0000 001f 0000 0014
0212520  0004 1c38 0004 1c38 0081 0023 0000 0000 0008 a3cc 0500 0017 0000 001f 0000 0014 0004 59cc 0004 59cc 0081 0028 0000 0000
0212600  0008 a3ec 0500 0017 0000 001f 0000 0014 0005 55d8 0005 55d8 0081 0032 0000 0000 0008 a40c 0500 0017 0000 001f 0000 0014
0212660  0004 b25c 0004 b25c 0081 002e 0000 0000 0008 a42c 0500 0017 0000 001f 0000 0014 0004 e930 0004 e930 0081 0030 0000 0000
0212740  0008 a44c 0500 0017 0000 001f 0000 0014 0003 9154 0003 91b4 0081 0014 0000 0000 0008 a46c 0500 0017 0000 0027 0000 0014
0213020  0004 7448 0004 7478 0081 0029 0000 0000 0008 a48c 0500 0017 0000 001f 0000 0014 0005 3e84 0005 3e84 0081 0031 0000 0000
0213100  0008 a4ac 0600 0017 0000 0037 0000 0018 0002 d50c 0002 d50c 0081 000d 0000 0000 0008 a4cc 0600 0017 0000 001f 0000 0018
0213160  0004 2388 0004 23c8 0081 0024 0000 0000 0008 a4ec 0600 0017 0000 001f 0000 0018 0003 c27c 0003 c27c 00a1 0018 0000 0000
0213240  0008 a50c 0600 0017 0000 0037 0000 0018 0002 f7d0 0002 f7d0 0081 0004 0000 0000 0008 a52c 0600 0017 0000 001f 0000 0018
0213320  0005 2c00 0005 2c00 0081 0030 0000 0000 0008 a54c 0600 0017 0000 001f 0000 0018 0003 b70c 0003 b8e0 0081 0018 0000 0000
0213400  0008 a56c 0600 0017 0000 001f 0000 0018 0005 4658 0005 4798 0081 0031 0000 0000 0008 a58c 0600 0017 0000 001f 0000 0018
0213460  0005 16e4 0005 17cc 0081 0030 0000 0000 0008 a5ac 0600 0017 0000 001f 0000 0018 0002 a530 0002 a5b0 0081 000a 0000 0000
0213540  0008 a5cc 0600 0017 0000 001f 0000 0018 0003 5058 0003 50fc 0081 0012 0000 0000 0008 a5ec 0600 0017 0000 0027 0000 0018
0213620  0004 5f2c 0004 5f2c 0081 0029 0000 0000 0008 a60c 0600 0017 0000 0027 0000 0018 0003 172c 0003 172c 0081 000f 0000 0000
0213700  0008 a62c 0600 0017 0000 001f 0000 0018 0003 68f4 0003 6970 0081 0012 0000 0000 0008 a64c 0600 0017 0000 001f 0000 0018
0213760  0003 697c 0003 697c 0081 0012 0000 0000 0008 a66c 0600 0017 0000 0027 0000 0018 0004 6b40 0004 6b40 0081 0029 0000 0000
0214040  0008 a68c 0600 0017 0000 0037 0000 0018 0002 e360 0002 e360 0081 000d 0000 0000 0008 a6ac 0600 0017 0000 0027 0000 0018
0214120  0004 623c 0004 623c 0081 0029 0000 0000 0008 a6cc 0600 0017 0000 001f 0000 0018 0003 e140 0003 e140 0081 001a 0000 0000
0214200  0008 a6ec 0600 0017 0000 001f 0000 0018 0003 91c4 0003 91fc 0081 0014 0000 0000 0008 a70c 0600 0017 0000 001f 0000 0018
0214260  0003 6a58 0003 6b04 0081 0012 0000 0000 0008 a72c 0600 0017 0000 0027 0000 0018 0004 9570 0004 9570 0081 0029 0000 0000
0214340  0008 a74c 0600 0017 0000 001f 0000 0018 0002 7214 0002 7214 0081 0004 0000 0000 0008 a76c 0700 0017 0000 0037 0000 001c
0214420  0002 d52c 0002 d52c 0081 000d 0000 0000 0008 a78c 0700 0017 0000 001f 0000 001c 0002 6220 0002 6220 0081 0003 0000 0000
0214500  0008 a7ac 0700 0017 0000 0027 0000 001c 0004 70b0 0004 70b0 0081 0029 0000 0000 0008 a7cc 0700 0017 0000 001f 0000 001c
```

```
0214560  0004 5bc4 0004 5bc4 0081 0028 0000 0000 0008 a7ec 0700 0017 0000 0037 0000 001c 0002 dff4 0002 dff4 0081 000d 0000 0000
0214640  0008 a80c 0700 0017 0000 0037 0000 001c 0002 de7c 0002 df14 0081 000d 0000 0000 0008 a82c 0700 0017 0000 001f 0000 001c
0214720  0005 1488 0005 15b4 0081 0030 0000 0000 0008 a94c 0700 0017 0000 001f 0000 001c 0003 e1d4 0003 e5e8 0081 001a 0000 0000
0215000  0008 a86c 0700 0017 0000 0027 0000 001c 0003 1044 0003 1044 0081 000f 0000 0000 0008 a88c 0700 0017 0000 001f 0000 001c
0215060  0003 d68c 0003 d68c 0081 001a 0000 0000 0008 a8ac 0700 0017 0000 001f 0000 001c 0003 de60 0003 dee4 0081 001a 0000 0000
0215140  0008 a8cc 0800 0017 0000 001f 0000 0020 0004 4bc4 0004 4bc4 0081 0027 0000 0000 0008 a8ec 0800 0017 0000 0037 0000 0020
0215220  0002 da78 0002 db74 0081 000d 0000 0000 0008 a90c 0800 0017 0000 0037 0000 0020 0002 d644 0002 da48 0081 000d 0000 0000
0215300  0008 a92c 0800 0017 0000 001f 0000 0020 0005 47d4 0005 4900 0081 0031 0000 0000 0008 a94c 0800 0017 0000 001f 0000 0020
0215360  0005 3c14 0005 3c14 0081 0031 0000 0000 0008 a96c 0800 0017 0000 0027 0000 0020 0004 6c10 0004 6c10 0081 0029 0000 0000
0215440  0008 a98c 0800 0017 0000 001f 0000 0020 0003 5114 0003 5204 0081 0012 0000 0000 0008 a9ac 0800 0017 0000 001f 0000 0020
0215520  0004 fa50 0004 fc18 0081 0030 0000 0000 0008 a9cc 0800 0017 0000 0037 0000 0020 0002 e410 0002 e554 0081 000d 0000 0000
0215600  0008 a9ec 0900 0017 0000 0037 0000 0024 0002 e9bc 0002 e30c 0081 000d 0000 0000 0008 aa0c 0a00 0017 0000 001f 0000 0028
0215660  0005 4180 0005 4180 0081 0031 0000 0000 0008 aa2c 0b00 0017 0000 001f 0000 002c 0005 3fa0 0005 4018 0081 0031 0000 0000
0215740  0008 aa4c 0b00 0017 0000 0037 0000 002c 0002 dba4 0002 dd40 0081 0001 0000 0000 ffff ffff 0000 083f 0000 001f 0000 0000
0216020  0003 991c 0003 991c 0081 0015 0000 0000 ffff ffff 0100 08c7 0000 001f 0000 0004 0003 ae94 0003 ae94 0081 0017 0000 0000
0216100  ffff ffff 0100 08df 0000 001f 0000 0004 0003 72e8 0003 72e8 0081 0014 0000 0000 ffff ffff 0400 08e7 0000 001f 0000 0010
0216160  0003 b328 0003 b328 0081 0017 0000 0000 ffff ffff 0100 08ef 0000 001f 0000 0004 0003 c4cc 0003 c4cc 00a1 0018 0000 0000
0216240  ffff ffff 0300 08f7 0000 001f 0000 000c 0003 be74 0003 be74 0081 0018 0000 0000 ffff ffff 0200 08ff 0000 001f 0000 0008
0216320  0004 1180 0004 1180 0081 0023 0000 0000 ffff ffff 0300 0907 0000 001f 0000 000c 0003 bd40 0003 bd40 0081 0018 0000 0000
0216400  ffff ffff 0200 090f 0000 001f 0000 0008 0003 aea4 0003 aea4 0081 0017 0000 0000 ffff ffff 0100 0917 0000 001f 0000 0004
0216460  0004 01b0 0004 01cc 0081 001e 0000 0000 ffff ffff 0200 0937 0000 0027 0000 0008 0005 89ec 0005 89ec 0081 0036 0000 0000
0216540  ffff ffff 0400 093f 0000 005f 0000 0010 000a 18f0 0002 438a 0003 0000 0000 0000 ffff ffff 0200 0947 0000 001f 0000 0008
0216620  0003 4e14 0003 4e14 0081 0012 0000 0000 ffff ffff 0200 0977 0000 0027 0000 0008 0003 09b0 0003 09b0 0081 000f 0000 0000
0216700  ffff ffff 0200 0abf 0000 001f 0000 0008 0003 98b0 0003 98b0 0081 0015 0000 0000 ffff ffff 0200 0ae7 0000 001f 0000 0008
0216760  0003 98f8 0003 98f8 0081 0015 0000 0000 ffff ffff 0200 000f 0000 001f 0000 0008 0003 48fc 0003 48fc 0081 0012 0000 0000
0217040  ffff ffff 0200 0daf 0000 0027 0000 0008 0003 053c 0003 053c 0081 000f 0000 0000 ffff ffff 0100 0db7 0000 001f 0000 0004
0217120  0003 afd8 0003 afd8 0081 0017 0000 0000 0008 accc 0200 0db7 0000 001f 0000 0008 0003 aff8 0003 aff8 0081 0017 0000 0000
0217200  ffff ffff 0200 0ddf 0000 001f 0000 0008 0003 98d4 0003 98d4 0081 0015 0000 0000 ffff ffff 0200 0de7 0000 001f 0000 0008
0217260  0003 9830 0003 9830 0081 0015 0000 0000 ffff ffff 0200 0df7 0000 001f 0000 0008 0003 968c 0003 968c 0081 0015 0000 0000
0217340  ffff ffff 0200 0dff 0000 001f 0000 0008 0003 a00c 0003 a098 0081 0017 0000 0000 ffff ffff 0200 0e07 0000 001f 0000 0008
0217420  0003 97f0 0003 97f0 0081 0015 0000 0000 ffff ffff 0200 0e0f 0000 001f 0000 0008 0003 9870 0003 9870 0081 0015 0000 0000
0217500  ffff ffff 0200 0e17 0000 001f 0000 0008 0003 9770 0003 9770 0081 0015 0000 0000 ffff ffff 0200 0e1f 0000 001f 0000 0008
0217560  0003 9810 0003 9810 0081 0015 0000 0000 ffff ffff 0200 0e27 0000 001f 0000 0008 0003 9850 0003 9850 0081 0015 0000 0000
0217640  ffff ffff 0200 0e2f 0000 001f 0000 0008 0003 9890 0003 9890 0081 0015 0000 0000 ffff ffff 0100 0e47 0000 001f 0000 0004
0217720  0003 afb8 0003 afb8 0081 0017 0000 0000 ffff ffff 0200 0e57 0000 001f 0000 0008 0003 9720 0003 9720 0081 0015 0000 0000
0220000  ffff ffff 0200 0e5f 0000 001f 0000 0008 0003 9748 0003 9748 0081 0015 0000 0000 ffff ffff 0200 0e67 0000 001f 0000 0008
0220060  0003 9734 0003 9734 0081 0015 0000 0000 ffff ffff 0200 0e6f 0000 001f 0000 0008 0003 975c 0003 975c 0081 0015 0000 0000
0220140  ffff ffff 0300 0e7f 0000 001f 0000 000c 0003 a250 0003 a250 0081 0017 0000 0000 ffff ffff 0000 10df 0000 001f 0000 0000
0220220  0003 aed0 0003 aed0 0081 0017 0000 0000 ffff ffff 0000 111f 0000 001f 0000 0000 0003 aef0 0003 aef0 0081 0017 0000 0000
0220300  ffff ffff 0100 15af 0000 005f 0000 0004 000a 18f0 0002 438a 0003 0013 0000 0000 ffff ffff 0000 0007 0000 001f 0000 0000
0220360  0003 4948 0003 4948 0081 0012 0000 0000 ffff ffff 0100 177f 0000 001f 0000 0004 0003 97a8 0003 97a8 0081 0015 0000 0000
0220440  ffff ffff 0200 178f 0000 001f 0000 0008 0003 9784 0003 9784 0081 0015 0000 0000 ffff ffff 0200 17a7 0000 001f 0000 0008
0220520  0003 9798 0003 9798 0081 0015 0000 0000 ffff ffff 0100 1c7f 0000 001f 0000 0004 0002 438c 0002 43e0 0081 0001 0000 0000
0220600  0008 afec 0200 1c7f 0000 001f 0000 0008 0002 459c 0002 45ec 0081 0001 0000 0000 0008 b00c 0300 1c7f 0000 001f 0000 000c
0220660  0002 46ac 0002 46d8 0081 0001 0000 0000 ffff ffff 0000 1c87 0000 001f 0000 0000 0003 b120 0003 b120 0081 0017 0000 0000
0220740  ffff ffff 0000 1c8f 0000 001f 0000 0000 0005 7634 0005 7634 0081 0035 0000 0000 ffff ffff 0200 1c9f 0000 001f 0000 0008
0221020  0003 3440 0003 3440 0081 0010 0000 0000 0008 b08c 0300 1c9f 0000 001f 0000 000c 0003 3460 0003 34bc 0081 0010 0000 0000
0221100  ffff ffff 0500 1cdf 0000 0057 0000 0014 000a 18f0 0002 438a 0003 0000 0000 0000 ffff ffff 0200 1ce7 0000 2c27 0000 0008
0221160  0005 a618 0005 a518 00a1 003b 0000 000c ffff ffff 0100 1cef 0000 0027 0000 0004 0004 7f34 0004 7f34 0081 0029 0000 0000
0221240  ffff ffff 0300 1d17 0000 001f 0000 000c 0003 a1e0 0003 a1e0 0081 0017 0000 0000 ffff ffff 0300 1d1f 0000 1ea7 0000 000c
0221320  0005 e260 0005 e260 0081 0041 0000 0000 0008 b14c 0400 1d1f 0000 1ea7 0000 0010 0005 e450 0005 e450 0081 0041 0000 0000
0221400  ffff ffff 0300 1d27 0000 1ea7 0000 000c 0005 e320 0005 e320 0081 0041 0000 0000 ffff ffff 0300 1d2f 0000 1ea7 0000 000c
0221460  0005 e3c4 0005 e3c4 0081 0041 0000 0000 ffff ffff 0200 1d37 0000 001f 0000 0008 000a 1918 000a 1918 0000 0000 0000 0000
0221540  0008 b1cc 0200 1d37 0000 1ea7 0000 0008 0005 e1f4 0005 e230 0081 0041 0000 0000 ffff ffff 0200 1d3f 0000 001f 0000 0008
0221620  000a 191a 000a 191a 0000 0000 0000 0000 ffff ffff 0200 1d47 0000 001f 0000 0008 000a 191c 000a 191c 0000 0000 0000 0000
```

```
0221700 ffff ffff 0300 1d4f 0000 001f 0000 000c 0003 9708 0003 9708 0081 0015 0000 0000 ffff ffff 0100 1d57 0000 217f 0000 0004
0221760 0005 ba78 0005 ba78 00a1 003d 0000 0000 ffff ffff 0100 1d67 0000 217f 0000 0004 0005 b804 0005 b804 0081 003e 0000 0000
0222040 ffff ffff 0100 1d6f 0000 001f 0000 0004 0002 51cc 0002 51cc 0081 0003 0000 0000 0008 b2ac 0200 1d6f 0000 001f 0000 0008
0222120 0002 5214 0002 5214 0081 0003 0000 0000 ffff ffff 0100 1d77 0000 001f 0000 0004 0002 51e4 0002 51e4 0081 0003 0000 0000
0222200 0008 b2ec 0200 1d77 0000 001f 0000 0008 0002 522c 0002 522c 0081 0003 0000 0000 ffff ffff 0100 1d7f 0000 001f 0000 0004
0222260 0002 51fc 0002 51fc 0081 0003 0000 0000 0008 b32c 0200 1d7f 0000 001f 0000 0008 0002 5244 0002 5244 0081 0003 0000 0000
0222340 ffff ffff 0100 1d8f 0000 001f 0000 0004 0003 96c8 0003 96c8 0081 0015 0000 0000 ffff ffff 0200 1d9f 0000 001f 0000 0008
0222420 0003 a384 0003 a3e4 0081 0017 0000 0000 ffff ffff 0100 1da7 0000 001f 0000 0004 0003 96b8 0003 96b8 0081 0015 0000 0000
0222500 0008 ad2c 0300 1de7 0000 001f 0000 000c 0003 e914 0003 e914 0081 001c 0000 0000 0008 b3cc 0400 1de7 0000 001f 0000 0010
0222560 0003 e950 0003 ea2c 0081 001c 0000 0000 ffff ffff 0200 1def 0000 1dff 0000 0008 0005 f318 0005 f318 0081 0044 0000 0000
0222640 0008 ad4c 0100 1df7 0000 1dff 0000 0004 0005 f280 0005 f280 0081 0044 0000 0000 0008 b42c 0200 1df7 0000 1dff 0000 0008
0222720 0005 f2a0 0005 f2a0 0081 0044 0000 000c 0008 b44c 0300 1df7 0000 1dff 0000 000c 0005 f2b8 0005 f2b8 0081 0044 0000 0000
0223000 0008 b46c 0400 1df7 0000 1dff 0000 0010 0005 f2d4 0005 f2d4 0081 0044 0000 0000 0008 ad6c 0100 1dff 0000 1dff 0000 0004
0223060 0005 f1cc 0005 f1cc 0081 0044 0000 0000 0008 b4ac 0200 1dff 0000 1dff 0000 0008 0005 f1ec 0005 f1ec 0081 0044 0000 0000
0223140 0008 b4cc 0300 1dff 0000 1dff 0000 000c 0005 f204 0005 f204 0081 0044 0000 0000 0008 b4ec 0400 1dff 0000 1dff 0000 0010
0223220 0005 f220 0005 f220 0081 0044 0000 0000 0008 a18c 0100 1e07 0000 1dff 0000 0004 0005 f694 0005 f694 0081 0044 0000 0000
0223300 0008 b52c 0200 1e07 0000 1dff 0000 0008 0005 f6b4 0005 f6b4 0081 0044 0000 0000 0008 b54c 0300 1e07 0000 1dff 0000 000c
0223360 0005 f6cc 0005 f6cc 0081 0044 0000 0000 0008 b56c 0400 1e07 0000 1dff 0000 0010 0005 f6e8 0005 f6e8 0081 0044 0000 0000
0223440 0008 adcc 0000 1e17 0000 2c27 0000 0000 0005 adc4 0005 adc4 0081 003c 0000 0000 0008 b5ac 0000 1e17 0000 3287 0000 0000
0223520 0005 a1fc 0005 a1fc 00c1 003a 0000 0000 0008 adec 0000 1e1f 0000 2c27 0000 0000 0005 b444 0005 b444 0081 003c 0000 0000
0223600 0008 ae0c 0100 1e27 0000 2c27 0000 0004 0005 a408 0005 a408 0081 003d 0000 0000 0008 ae8c 0000 1e5f 0000 001f 0000 0000
0223660 0005 77a8 0005 77a8 0081 0035 0000 0000 0008 aeac 0200 1e67 0000 0057 0000 0008 000a 18f0 000a 18f0 0000 0000 0000 0000
0223740 ffff ffff 0100 1ea7 0000 0027 0000 0004 0003 0568 0003 0568 0081 000f 0000 0000 0008 b66c 0200 1ea7 0000 0027 0000 0008
0224020 0003 0590 0003 059c 0081 000f 0000 0000 0008 b68c 0200 1ea7 0000 1ea7 0000 0008 0005 e480 0005 e4d0 0081 0041 0000 0000
0224100 0008 b6ac 0300 1ea7 0000 1ea7 0000 000c 0005 e50c 0005 e570 0081 0041 0000 0000 0008 b6cc 0400 1ea7 0000 1ea7 0000 0010
0224160 0005 e5ac 0005 e624 0081 0041 0000 0000 0008 b6ec 0500 1ea7 0000 1ea7 0000 0014 0005 e668 0005 e6f8 0081 0041 0000 0000
0224240 0008 b70c 0600 1ea7 0000 1ea7 0000 0018 0005 e740 0005 e7e4 0081 0041 0000 0000 0008 b72c 0700 1ea7 0000 1ea7 0000 001c
0224320 0005 e830 0005 e3ec 0081 0041 0000 0000 ffff ffff 0100 1eaf 0000 001f 0000 0004 0003 b0e0 0003 b0e0 0081 0017 0000 0000
0224400 0008 b76c 0100 1eaf 0000 31c7 0000 0004 0005 bb84 0005 bb84 0081 003f 0000 0000 ffff ffff 0000 1ec7 0000 2c27 0000 0000
0224460 0005 afe8 0005 afe8 0081 003c 0000 0000 0008 b7ac 0000 1ec7 0000 3287 0000 0000 0005 a20c 0005 a20c 00c1 003a 0000 0000
0224540 ffff ffff 0000 1f17 0000 001f 0000 0000 0004 9ed8 0004 9ed8 0081 002a 0000 0000 ffff ffff 0000 1f1f 0000 001f 0000 0000
0224620 0004 40c0 0004 40c0 0081 0026 0000 0000 0008 b80c 0100 1f1f 0000 001f 0000 0004 0004 40e4 0004 411c 0081 0026 0000 0000
0224700 ffff ffff 0200 1f47 0000 2c27 0000 0008 0005 b35c 0005 b35c 0081 003c 0000 0000 0008 b84c 0200 1f47 0000 3287 0000 0008
0224760 0005 a1cc 0005 a1cc 00c1 003a 0000 0000 ffff ffff 0200 1f4f 0000 2c27 0000 0008 0005 b374 0005 b374 0081 003c 0000 0000
0225040 0008 b88c 0200 1f4f 0000 3287 0000 0008 0005 a1dc 0005 a1dc 00c1 003a 0000 0000 ffff ffff 0200 1f67 0000 001f 0000 0008
0225120 0003 2410 0003 243c 0081 0010 0000 0000 ffff ffff 0100 1f77 0000 31c7 0000 0004 0005 be08 0005 be08 0081 003f 0000 0000
0225200 ffff ffff 0200 1f8f 0000 001f 0000 0008 0002 5b80 0002 5bf0 0081 0003 0000 0000 0008 b90c 0300 1f8f 0000 001f 0000 000c
0225260 0002 5c50 0002 5de0 0081 0003 0000 0000 ffff ffff 0100 1fa7 0000 001f 0000 0004 0003 1de4 0003 1f80 0081 0010 0000 0000
0225340 ffff ffff 0300 1fb7 0000 001f 0000 000c 0002 71cc 0002 71cc 0081 0004 0000 0000 ffff ffff 0100 1fc7 0000 001f 0000 0004
0225420 0003 48cc 0003 48cc 0081 0012 0000 0000 0008 b98c 0300 1fc7 0000 001f 0000 000c 0004 c614 0004 c614 0081 0030 0000 0000
0225500 ffff ffff 0100 1fd7 0000 31c7 0000 0004 0005 bba0 0005 bba0 0081 003f 0000 0000 ffff ffff 0100 1fe7 0000 2c27 0000 0004
0225560 0005 aaac 0005 aaac 0081 003c 0000 0000 ffff ffff 0100 1ff7 0000 31c7 0000 0004 0005 bbc0 0005 bbc0 0081 003f 0000 0000
0225640 ffff ffff 0100 1fff 0000 001f 0000 0004 0003 48e4 0003 48e4 0081 0012 0000 0000 ffff ffff 0200 2017 0000 001f 0000 0008
0225720 0002 6694 0002 6694 0081 0003 0000 0000 ffff ffff 0100 202f 0000 001f 0000 0004 0002 7e38 0002 7e48 0081 0006 0000 0000
0226000 0008 ba6c 0200 202f 0000 001f 0000 0008 0002 7e6c 0002 7eb0 0081 0006 0000 0000 ffff ffff 0200 2037 0000 001f 0000 0008
0226060 0003 7b4c 0003 7b4c 0081 0014 0000 0000 ffff ffff 0200 203f 0000 001f 0000 0008 0003 af94 0003 af94 0081 0017 0000 0000
0226140 ffff ffff 0100 2047 0000 001f 0000 0004 0003 23b8 0003 23b8 0081 0010 0000 0000 ffff ffff 0200 204f 0000 001f 0000 0008
0226220 0002 6b0c 0002 6b9c 0081 0003 0000 0000 ffff ffff 0100 2057 0000 001f 0000 0004 0003 724c 0003 7260 0081 0014 0000 0000
0226300 0008 bb2c 0200 2057 0000 001f 0000 0008 0003 72d8 0003 72d8 0081 0014 0000 0000 ffff ffff 0300 205f 0000 001f 0000 000c
0226360 0003 9ec0 0003 9f30 0081 0016 0000 0000 ffff ffff 0100 2067 0000 001f 0000 0004 0003 23e4 0003 23e4 0081 0010 0000 0000
0226440 ffff ffff 0200 206f 0000 001f 0000 0008 0002 7d6c 0002 7d6c 0081 0006 0000 0000 0008 bbac 0300 206f 0000 001f 0000 000c
0226520 0002 7de8 0002 7de8 0081 0006 0000 0000 ffff ffff 0300 2077 0000 001f 0000 000c 0003 204c 0003 204c 0081 0010 0000 0000
0226600 0008 bbec 0400 2077 0000 001f 0000 0010 0003 2074 0003 20c4 0081 0010 0000 0000 0008 bc0c 0500 2077 0000 001f 0000 0014
0226660 0003 20f4 0003 20f4 0081 0010 0000 0000 ffff ffff 0000 208f 0000 0027 0000 0000 0004 845c 0004 845c 0081 0029 0000 0000
0226740 ffff ffff 0000 2097 0000 0027 0000 0000 0004 91fc 0004 91fc 0081 0029 0000 0000 ffff ffff 0200 209f 0000 0057 0000 0008
```

```
0227020  000a 18f0 0002 438a 0003 0000 0000 0000 ffff ffff 0100 20af 0000 0027 0000 0004 0004 7ef0 0004 7ef0 0081 0029 0000 0000
0227100  ffff ffff 0100 20b7 0000 2c27 0000 0004 0005 a418 0005 a418 0081 003d 0000 0000 ffff ffff 0000 20bf 0000 001f 0000 0000
0227160  000a 18f0 0002 438a 0003 0039 0000 0000 ffff ffff 0200 20c7 0000 31c7 0000 0008 0005 c6b8 0005 c714 0081 003f 0000 0000
0227240  ffff ffff 0100 20f7 0000 001f 0000 0004 0002 7f0c 0002 7f0c 0081 0007 0000 0000 ffff ffff 0300 20ff 0000 217f 0000 000c
0227320  0005 baf4 0005 baf4 00a1 003d 0000 0000 ffff ffff 0200 2107 0000 0057 0000 0008 000a 18f0 0002 438a 0003 0000 0000 0000
0227400  0008 af2c 0100 211f 0000 001f 0000 0004 0003 b01c 0003 b01c 0081 0017 0000 0000 ffff ffff 0100 2157 0000 2c27 0000 0004
0227460  0005 b630 0005 b630 0081 003c 0000 0000 ffff ffff 0100 2177 0000 001f 0000 0004 0003 4968 0003 4968 0081 0012 0000 0000
0227540  ffff ffff 0200 217f 0000 217f 0000 0008 0005 b898 0005 b898 0081 003e 0000 0000 0008 bdec 0300 217f 0000 217f 0000 000c
0227620  0005 b8ec 0005 b8ec 0081 003e 0000 0000 ffff ffff 0100 2187 0000 001f 0000 0004 0002 6aa4 0002 6aa4 0081 0003 0000 0000
0227700  ffff ffff 0000 2197 0000 001f 0000 0000 0005 76c4 0005 76c4 0081 0035 0000 0000 ffff ffff 0200 21b7 0000 217f 0000 0008
0227760  0005 b9c4 0005 b9c4 0081 003e 0000 0000 ffff ffff 0200 21bf 0000 001f 0000 0008 0002 fdcc 0002 fdcc 0081 000e 0000 0000
0230040  ffff ffff 0200 21c7 0000 217f 0000 0008 0005 b938 0005 b938 0081 003e 0000 0000 ffff ffff 0000 21ef 0000 001f 0000 0000
0230120  0003 993c 0003 993c 0081 0015 0000 0000 ffff ffff 0000 222f 0000 001f 0000 0000 0003 995c 0003 995c 0081 0015 0000 0000
0230200  ffff ffff 0200 224f 0000 0057 0000 0008 000a 18f0 000a f2e8 0003 0000 0000 0000 0008 bf0c 0200 224f 0000 004f 0000 0008
0230260  000a 18f0 0002 438a 0013 003a 0000 0000 ffff ffff 0200 2257 0000 3287 0000 0008 000a 18f0 000a a5a0 0003 0000 0000 0000
0230340  ffff ffff 0000 225f 0000 001f 0000 0000 0002 d2c4 0002 d2c4 0081 000c 0000 0000 0008 bf6c 0200 225f 0000 001f 0000 0008
0230420  0002 d2f4 0002 d2f4 0081 000c 0000 0000 ffff ffff 0100 226f 0000 0027 0000 0004 0004 7b1c 0004 7b50 0081 0029 0000 0000
0230500  0008 bfac 0300 226f 0000 001f 0000 000c 0004 a1f0 0004 a1f0 0081 002b 0000 0000 ffff ffff 0100 2277 0000 001f 0000 0004
0230560  0004 9e28 0004 9e28 0081 002a 0000 0000 ffff ffff 0300 227f 0000 001f 0000 000c 0004 a1cc 0004 a1cc 0081 002b 0000 0000
0230640  ffff ffff 0300 2287 0000 001f 0000 000c 0003 e8cc 0003 e8cc 0081 001c 0000 0000 ffff ffff 0000 2297 0000 001f 0000 0000
0230720  0005 75cc 0005 75cc 0081 0035 0000 0000 ffff ffff 0100 229f 0000 001f 0000 0004 0003 96e8 0003 96e8 0081 0015 0000 0000
0231000  ffff ffff 0100 22af 0000 001f 0000 0004 0003 22ec 0003 2310 0081 0010 0000 0000 ffff ffff 0300 22e7 0000 005f 0000 000c
0231060  000a 18f0 000b d624 0003 0000 0000 0000 ffff ffff 0200 22ef 0000 005f 0000 0008 000a 18f0 000b d48c 0003 0000 0000 0000
0231140  ffff ffff 0200 22f7 0000 0037 0000 0008 0002 d3d8 0002 d418 0081 000d 0000 0000 0008 c0ec 0300 22f7 0000 0037 0000 000c
0231220  0002 d388 0002 d388 0081 000d 0000 0000 ffff ffff 0300 231f 0000 001f 0000 000c 0003 9714 0003 9714 0081 0015 0000 0000
0231300  ffff ffff 0000 2347 0000 001f 0000 0000 0003 aec0 0003 aec0 0081 0017 0000 0000 ffff ffff 0000 2357 0000 001f 0000 0000
0231360  0002 d0cc 0002 d0cc 0081 000c 0000 0000 ffff ffff 0300 2387 0000 001f 0000 000c 0002 d10c 0002 d150 0081 000c 0000 0000
0231440  ffff ffff 0100 23a7 0000 001f 0000 0004 0003 2934 0003 2934 0081 0010 0000 0000 0008 c1ac 0200 23a7 0000 001f 0000 0008
0231520  0003 28a8 0003 290c 0081 0010 0000 0000 0008 c1cc 0300 23a7 0000 2c27 0000 000c 0005 a9bc 0005 a9f0 0081 003c 0000 0000
0231600  0008 c1ec 0300 23a7 0000 3287 0000 000c 000c 1994 000c 1994 0041 0000 0000 0000 ffff ffff 0100 23af 0000 001f 0000 0004
0231660  0003 c360 0003 c360 00a1 0018 0000 0000 0008 c22c 0200 23af 0000 001f 0000 0008 0003 2668 0003 2698 0081 0010 0000 0000
0231740  ffff ffff 0200 23bf 0000 2c27 0000 0008 0005 a634 0005 a634 00a1 003b 0000 0000 ffff ffff 0100 23c7 0000 2c27 0000 0004
0232020  0005 a5e0 0005 a5e0 00a1 003b 0000 0000 ffff ffff 0300 23cf 0000 2c27 0000 000c 0005 b2a4 0005 b2a4 0081 003c 0000 0000
0232100  0008 c2ac 0300 23cf 0000 3287 0000 000c 0005 a1ac 0005 a1ac 00c1 003a 0000 0000 ffff ffff 0300 23d7 0000 2c27 0000 000c
0232160  0005 b300 0005 b300 0081 003c 0000 0000 0008 c2ec 0300 23d7 0000 3287 0000 000c 0005 a1bc 0005 a1bc 00c1 003a 0000 0000
0232240  ffff ffff 0300 23df 0000 2c27 0000 000c 0005 aa0c 0005 aa40 0081 003c 0000 0000 0008 c32c 0300 23df 0000 3287 0000 000c
0232320  0005 a18c 0005 a18c 00c1 003a 0000 0000 ffff ffff 0300 23f7 0000 217f 0000 000c 0005 bab0 0005 bab0 00a1 003d 0000 0000
0232400  0008 c36c 0400 23f7 0000 217f 0000 0010 0005 bad0 0005 bad0 00a1 003d 0000 0000 ffff ffff 0300 23ff 0000 001f 0000 000c
0232460  0005 9ffc 0005 9ffc 0081 0039 0000 0000 ffff ffff 0100 240f 0000 31c7 0000 0004 0005 bbdc 0005 bbdc 0081 003f 0000 0000
0232540  0008 c3cc 0200 240f 0000 31c7 0000 0008 0005 bbfc 0005 bbfc 0081 003f 0000 0000 ffff ffff 0100 2417 0000 2c27 0000 0004
0232620  0005 a438 0005 a438 0081 003d 0000 0000 0008 c40c 0200 2417 0000 2c27 0000 0008 0005 a460 0005 a498 0081 003d 0000 0000
0232700  ffff ffff 0000 2427 0000 001f 0000 0000 0003 b0fc 0003 b0fc 0081 0017 0000 0000 ffff ffff 0400 242f 0000 004f 0000 0010
0232760  000a 18f0 0007 a7f8 0013 003a 0000 000c ffff ffff 0600 2447 0000 001f 0000 0000 0004 a6cc 0004 a6e0 0081 002c 0000 0000
0233040  0008 c48c 0100 2447 0000 001f 0000 0004 0004 acc8 0004 ad14 0081 002d 0000 0000 ffff ffff 0300 245f 0000 005f 0000 000c
0233120  000a 18f0 0002 439a 0013 003c 0000 0000 ffff ffff 0200 247f 0000 004f 0000 0008 000a 18f0 0002 439a 0003 0000 0000 0000
0233200  ffff ffff 0100 2487 0000 2c27 0000 0004 0005 ab8c 0005 ab8c 0081 003c 0000 0000 ffff ffff 0400 24af 0000 004f 0000 0010
0233260  000a 18f0 0007 a694 0013 003a 0000 0000 ffff ffff 0200 24bf 0000 004f 0000 0008 000a 18f0 0007 ded4 0013 003b 0000 0000
0233340  ffff ffff 0100 24df 000c 0027 0000 0004 0003 0550 0003 0550 0081 000f 0000 0000 ffff ffff 0400 24f7 0000 001f 0000 0010
0233420  0003 d5e4 0003 d5e4 0081 001a 0000 0000 ffff ffff 0200 2507 0000 2c27 0000 0008 0005 a4c8 0005 a4c8 00a1 003b 0000 0000
0233500  ffff ffff 0100 250f 0000 2c27 0000 0004 0005 a588 0005 a588 00a1 003b 0000 0000 ffff ffff 0100 2517 0000 2c27 0000 0004
0233560  0005 a51c 0005 a51c 00a1 003b 0000 0000 ffff ffff 0200 2527 0000 001f 0000 0008 0002 69d8 0002 69d8 0081 0003 0000 0000
0233640  0008 c60c 0300 2527 000c 001f 0000 000c 0002 69e8 0002 69e8 0081 0003 0000 0000 ffff ffff 0200 252f 0000 31c7 0000 0008
0233720  0005 c448 0005 c448 0081 003f 0000 0000 ffff ffff 0100 253f 0000 001f 0000 0004 0003 96d8 0003 96d8 0081 0015 0000 0000
0234000  ffff ffff 0100 2557 0000 255f 0000 0004 0005 c888 0005 c888 0081 0040 0000 0000 ffff ffff 0100 255f 0000 255f 0000 0004
0234060  0005 c78c 0005 c934 0081 0040 0000 0000 0008 c6ac 0100 255f 0000 3287 0000 0004 0005 a22c 0005 a22c 00c1 003a 0000 0000
```

```
0234140 ffff ffff 0200 25d7 0000 001f 0000 0008 0003 97d0 0003 97d0 0081 0015 0000 0000 ffff ffff 0200 2607 0000 0057 0000 0008
0234220 000a 18f0 0002 438a 0003 0000 0000 0000 ffff ffff 0200 2617 0000 001f 0000 0008 0002 758c 0002 75c8 0081 0004 0000 0000
0234300 0008 c72c 0400 2617 0000 001f 0000 0010 0002 75ec 0002 76a0 0081 0004 0000 0000 ffff ffff 0000 261f 0000 2c27 0000 0000
0234360 0005 a6e4 0005 a6e4 0081 003c 0000 0000 0008 c76c 0000 261f 0000 3287 0000 0000 0005 a0ec 0005 a0ec 00c1 003a 0000 0000
0234440 0008 c78c 0100 261f 0000 2c27 0000 0004 0005 a500 0005 a500 00a1 003b 0000 0000 ffff ffff 0100 2637 0000 0027 0000 0004
0234520 0004 8cbc 0004 8cbc 0081 0029 0000 0000 0008 c7cc 0200 2637 0000 0027 0000 0008 0004 8cd0 0004 8cd0 0081 0029 0000 0000
0234600 ffff ffff 0300 264f 0000 1ea7 0000 000c 0005 e2b4 0005 e2b4 0081 0041 0000 0000 ffff ffff 0200 2657 0000 001f 0000 0008
0234660 0003 a2a8 0003 a2a8 0081 0017 0000 000c 0008 c92c 0300 2657 0000 001f 0000 000c 0003 a32c 0003 a32c 0081 0017 0000 0000
0234740 ffff ffff 0200 2687 0000 001f 0000 0008 0003 2464 0003 2490 0081 0010 0000 0000 ffff ffff 0200 268f 0000 001f 0000 0008
0235020 0003 24b8 0003 24e4 0081 0010 0000 0000 ffff ffff 0100 26b7 0000 001f 0000 0004 0005 7984 0005 7984 0081 0035 0000 0000
0235100 0008 c8ac 0200 26b7 0000 001f 0000 0008 0005 799c 0005 799c 0081 0035 0000 0000 ffff ffff 0000 26bf 0000 001f 0000 0000
0235160 0003 3c10 0003 3c10 0081 0011 0000 0000 0008 c8ec 0100 26bf 0000 001f 0000 0004 0003 3c34 0003 3c34 0081 0011 0000 0000
0235240 0008 c90c 0200 26bf 0000 001f 0000 0008 0003 3c4c 0003 3c7c 0081 0011 0000 0000 ffff ffff 0200 26d7 0000 001f 0000 0008
0235320 0003 4a14 0003 4314 0081 0012 0000 0000 0008 c94c 0300 26d7 0000 001f 0000 000c 0003 4a58 0003 4a58 0081 0012 0000 0000
0235400 0008 c96c 0500 26d7 0000 001f 0000 0014 0003 4e50 0003 504c 0081 0012 0000 0000 ffff ffff 0200 26df 0000 002f 0000 0008
0235460 0005 8bc8 0005 8bc8 0081 0037 0000 0000 0008 c9ac 0300 26df 0000 002f 0000 000c 0005 8cf0 0005 8cf0 0081 0037 0000 0000
0235540 0008 c9cc 0500 26df 0000 002f 0000 0014 0005 8c40 0005 8cb0 0081 0037 0000 0000 ffff ffff 0500 26f7 0000 0057 0000 0014
0235620 000a 18f0 0002 438a 0003 0000 0000 0000 ffff ffff 0000 26ff 0000 001f 0000 0000 0003 6c18 0003 6c18 0081 0012 0000 0000
0235700 ffff ffff 0200 2707 0000 001f 0000 0008 0003 4d38 0003 4d48 0081 0012 0000 0000 ffff ffff 0200 270f 0000 0057 0000 0008
0235760 000a 18f0 0002 438a 0003 0000 0000 0000 ffff ffff 0000 2727 0000 001f 0000 0000 0003 af10 0003 af10 0081 0017 0000 0000
0236040 ffff ffff 0400 2757 0000 001f 0000 0010 0003 8aa4 0003 8b78 0081 0014 0000 0000 ffff ffff 0000 275f 0000 001f 0000 0000
0236120 0004 a944 0004 a944 0081 002d 0000 0000 0008 cacc 0100 275f 0000 001f 0000 0004 0004 aaa8 0004 ab08 0081 002d 0000 0000
0236200 ffff ffff 0400 2787 0000 001f 0000 0010 0004 a2cc 0004 a2cc 0081 002b 0000 0000 0008 afac 0100 278f 0000 0027 0000 0004
0236260 0004 951c 0004 951c 0081 0029 0000 0000 ffff ffff 0200 2797 0000 31c7 0000 0008 0005 c66c 0005 c66c 0081 003f 0000 0000
0236340 ffff ffff 0100 27bf 0000 001f 0000 0004 0004 c574 0004 c5d8 0081 0030 0000 0000 ffff ffff 0100 27cf 0000 001f 0000 0004
0236420 0003 b0c0 0003 b0c0 0081 0017 0000 0000 ffff ffff 0100 2817 0000 001f 0000 0004 0003 b05c 0003 b05c 0081 0017 0000 0000
0236500 ffff ffff 0100 2827 0000 001f 0000 0004 0003 73f0 0003 7488 0081 0014 0000 0000 0008 cbcc 0200 2827 0000 001f 0000 0008
0236560 0003 b09c 0003 b09c 0081 0017 0000 0000 ffff ffff 0200 284f 0000 004f 0000 0008 000a 18f0 0007 df14 0013 003c 0000 0000
0236640 ffff ffff 0200 2857 0000 004f 0000 0008 000a 19f0 0007 d6dc 0013 003a 0000 0000 ffff ffff 0200 2887 0000 0057 0000 0008
0236720 000a 18f0 0002 438a 0003 0000 0000 0000 0008 cc4c 0200 2887 0000 001f 0000 0008 000a 18f0 0002 438a 0003 0020 0000 0000
0237000 ffff ffff 0100 288f 0000 001f 0000 0004 0003 b03c 0003 b03c 0081 0017 0000 0000 ffff ffff 0100 2897 0000 001f 0000 0004
0237060 0002 59d0 0002 59d0 0081 0003 0000 0000 ffff ffff 0300 28a7 0000 31c7 0000 000c 0005 c050 0005 c050 0081 003f 0000 0000
0237140 0008 cccc 0400 28a7 0000 31c7 0000 0010 0005 c038 0005 c038 0081 003f 0000 0000 ffff ffff 0300 28af 0000 31c7 0000 000c
0237220 0005 be7c 0005 be7c 0081 003f 0000 0000 ffff ffff 0500 28b7 0000 31c7 0000 0014 0005 be98 0005 be98 0081 003f 0000 0000
0237300 ffff ffff 0300 28bf 0000 31c7 0000 000c 0005 bec8 0005 bec8 0081 003f 0000 0000 0008 aaac 0300 28c7 0000 31c7 0000 000c
0237360 0005 bee4 0005 bee4 0081 003f 0000 0000 ffff ffff 0300 28cf 0000 31c7 0000 000c 0005 bf00 0005 bf00 0081 003f 0000 0000
0237440 ffff ffff 0300 28d7 0000 31c7 0000 000c 0005 bf1c 0005 bf1c 0081 003f 0000 0000 0008 aacc 0300 28df 0000 31c7 0000 000c
0237520 0005 bf38 0005 bf38 0081 003f 0000 0000 0008 aaec 0300 28e7 0000 31c7 0000 000c 0005 bf54 0005 bf54 0081 003f 0000 0000
0237600 0008 ab0c 0300 28ef 0000 31c7 0000 000c 0005 bf70 0005 bf70 0081 003f 0000 0000 0008 ab2c 0300 28f7 0000 31c7 0000 000c
0237660 0005 bf8c 0005 bf8c 0081 003f 0000 0000 0008 ab4c 0300 28ff 0000 31c7 0000 000c 0005 bfa8 0005 bfa8 0081 003f 0000 0000
0237740 0008 ab6c 0400 2907 0000 31c7 0000 0010 0005 bfc4 0005 bfc4 0081 003f 0000 0000 0008 ab8c 0300 290f 0000 31c7 0000 000c
0240020 0005 bfe4 0005 bfe4 0081 003f 0000 0000 0008 abac 0300 2917 0000 31c7 0000 000c 0005 c000 0005 c000 0081 003f 0000 0000
0240100 ffff ffff 0300 291f 0000 31c7 0000 000c 0005 c01c 0005 c01c 0081 003f 0000 0000 ffff ffff 0200 2927 0000 001f 0000 0008
0240160 0003 a544 0003 a5bc 0081 0017 0000 0000 0008 abcc 0100 2937 0000 2c27 0000 0004 0005 a39c 0005 a39c 0081 003d 0000 0000
0240240 0008 ac0c 0100 2947 0000 004f 0000 0004 000a 18f0 0002 438a 0003 0000 0000 0000 ffff ffff 0200 294f 0000 2c27 0000 0008
0240320 0005 a71c 0005 a780 0081 003c 0000 0000 0008 cf4c 0200 294f 0000 3287 0000 0008 000c 1a74 000c 1a74 0041 0000 0000 0000
0240400 0008 cf6c 0300 294f 0000 27c7 0000 000c 0005 efdc 0005 efdc 0081 0043 0000 0000 0008 cf8c 0300 294f 0000 3287 0000 000c
0240460 000c 1aac 000c 1aac 0041 0000 0000 0000 ffff ffff 0300 2957 0000 27c7 0000 000c 0005 f044 0005 f044 0081 0043 0000 0000
0240540 0008 cfcc 0300 2957 0000 3287 0000 000c 0005 a31c 0005 a31c 00c1 003a 0000 0000 ffff ffff 0300 295f 0000 20cf 0000 000c
0240620 0005 e94c 0005 e94c 0081 0042 0000 0000 0008 d00c 0300 295f 0000 3287 0000 000c 0005 a26c 0005 a26c 00c1 003a 0000 0000
0240700 ffff ffff 0200 2967 0000 20cf 0000 0008 0005 eb4c 0005 eb8c 0081 0042 0000 0000 ffff ffff 0200 296f 0000 2c27 0000 0008
0240760 0005 a79c 0005 a7d0 0081 003c 0000 0000 0008 d06c 0200 296f 0000 3287 0000 0008 0005 a10c 0005 a10c 00c1 003a 0000 0000
0241040 0008 d08c 0300 296f 0000 27c7 0000 000c 0005 eff8 0005 eff8 0081 0043 0000 0000 0008 d0ac 0300 296f 0000 3287 0000 000c
0241120 0005 a30c 0005 a30c 00c1 003a 0000 0000 0008 ac2c 0300 2977 0000 27c7 0000 000c 0005 f0d8 0005 f0d8 0081 0043 0000 0000
0241200 0008 d0ec 0300 2977 0000 3287 0000 000c 0005 a32c 0005 a32c 00c1 003a 0000 0000 ffff ffff 0000 2987 0000 001f 0000 0000
```

```
0241260 0003 270c 0003 270c 0081 0010 0000 0000 0008 d12c 0100 2987 0000 001f 0000 0004 0003 26c0 0003 26ec 0081 0010 0000 0000
0241340 ffff ffff 0100 29bf 0000 001f 0000 0004 0004 0e5c 0004 0e5c 0081 0021 0000 0000 ffff ffff 0000 29c7 0000 0027 0000 0000
0241420 0004 842c 0004 842c 0081 0029 0000 0000 ffff ffff 0000 29cf 0000 001f 0000 0000 0002 d2dc 0002 d2dc 0081 000c 0000 0000
0241500 ffff ffff 0000 29d7 0000 001f 0000 0000 0002 d0ec 0002 d0ec 0081 000c 0000 0000 ffff ffff 0000 29df 0000 001f 0000 0000
0241560 0003 af30 0003 af30 0081 0017 0000 0000 ffff ffff 0100 2a07 0000 001f 0000 0004 0003 96a8 0003 96a8 0081 0015 0000 0000
0241640 ffff ffff 0100 2a27 0000 0027 0000 0004 0004 8518 0004 8518 0081 0029 0000 0000 0008 d22c 0200 2a27 0000 0027 0000 0008
0241720 0004 8530 0004 8530 0081 0029 0000 0000 ffff ffff 0000 2a2f 0000 0027 0000 0000 0004 8a98 0004 8af0 0081 0029 0000 0000
0242000 ffff ffff 0000 2a3f 0000 0027 0000 0000 0004 8414 0004 8414 0081 0029 0000 0000 ffff ffff 0100 2a57 0000 001f 0000 0004
0242060 0003 96f8 0003 96f8 0081 0015 0000 0000 ffff ffff 0200 2a5f 0000 001f 0000 0008 0003 a4c4 0003 a518 0081 0017 0000 0000
0242140 ffff ffff 0300 2a67 0000 001f 0000 000c 0003 3b0c 0003 3b0c 0081 0011 0000 0000 ffff ffff 0100 2a77 0000 2c27 0000 0004
0242220 0005 a7ec 0005 a910 0081 003c 0000 0000 0008 d30c 0100 2a77 0000 3287 0000 0004 000c 1bec 000c 1bec 0041 0000 0000 0000
0242300 0008 d32c 0200 2a77 0000 2c27 0000 0008 0005 a928 0005 a850 0081 003c 0000 0000 0008 d34c 0200 2a77 0000 3287 0000 0008
0242360 0005 a12c 0005 a12c 00c1 003a 0000 0000 ffff ffff 0100 2a7f 0000 2c27 0000 0004 0005 a39c 0005 a38c 0081 003d 0000 0000
0242440 ffff ffff 0300 2ad7 0000 001f 0000 000c 0003 99cc 0003 9ab8 0081 0016 0000 0000 0008 ac6c 0300 2ae7 0000 001f 0000 000c
0242520 0003 1b0c 0003 1b0c 0081 0010 0000 0000 ffff ffff 0100 2aef 0000 001f 0000 0004 0003 1b68 0003 1b68 0081 0010 0000 0000
0242600 ffff ffff 0400 2af7 0000 001f 0000 0010 0003 c17c 0003 c17c 00a1 0018 0000 0000 ffff ffff 0000 2b07 0000 001f 0000 0000
0242660 0003 999c 0003 999c 0081 0015 0000 0000 ffff ffff 0200 2b1f 0000 001f 0000 0008 0003 c2ac 0003 c2ac 00a1 0018 0000 0000
0242740 ffff ffff 0200 2b47 0000 001f 0000 0008 0003 03b4 0003 03b4 0081 000e 0000 0000 0008 d46c 0300 2b47 0000 001f 0000 000c
0243020 0003 03d0 0003 03d0 0081 000e 0000 0000 0008 d48c 0400 2b47 0000 001f 0000 0010 0003 03ec 0003 04cc 0081 000e 0000 0000
0243100 ffff ffff 0100 2b4f 0000 217f 0000 0004 0005 ba94 0005 ba94 00a1 003d 0000 0000 ffff ffff 0200 2b57 0000 217f 0000 0008
0243160 0005 b82c 0005 b970 0081 003e 0000 0000 ffff ffff 0100 2b5f 0000 001f 0000 0004 0003 af50 0003 af50 0081 0017 0000 0000
0243240 ffff ffff 0100 2b6f 0000 3287 0000 0004 000a 18f0 000a 18f0 0000 0000 0000 0000 ffff ffff 0100 2b77 0000 001f 0000 0004
0243320 0003 44d0 0003 4570 0081 0011 0000 0000 0008 d54c 0300 2b77 0000 001f 0000 000c 0003 45d4 0003 4628 0081 0011 0000 0000
0243400 ffff ffff 0300 2b87 0000 20cf 0000 000c 0005 ea5c 0005 eb34 0081 0042 0000 0000 ffff ffff 0300 2b97 0000 001f 0000 000c
0243460 0003 d568 0003 d568 0081 001a 0000 0000 ffff ffff 0400 2ba7 0000 001f 0000 0010 0003 7520 0003 7520 0081 0014 0000 0000
0243540 ffff ffff 0200 2baf 0000 001f 0000 0008 0003 b5cc 0003 b5cc 0081 0018 0000 0000 0008 d5ec 0300 2baf 0000 001f 0000 000c
0243620 0003 b5fc 0003 b5fc 0081 0018 0000 0000 ffff ffff 0100 2bcf 0000 001f 0000 0004 0004 42c4 0004 42c4 0081 0027 0000 0000
0243700 0008 d62c 0200 2bcf 0000 001f 0000 0008 0004 42f4 0004 42f4 0081 0027 0000 0000 ffff ffff 0100 2bd7 0000 255f 0000 0004
0243760 0005 d574 0005 d574 0081 0040 0000 0000 ffff ffff 0100 2bdf 0000 255f 0000 0004 0005 d478 0005 d520 0081 0040 0000 0000
0244040 0008 d68c 0100 2bdf 0000 3287 0000 0004 0005 a24c 0005 a24c 00c1 003a 0000 0000 ffff ffff 0200 2bff 0000 001f 0000 0008
0244120 0002 c44c 0002 c44c 0081 000c 0000 0000 0008 d6cc 0300 2bff 0000 001f 0000 000c 0002 c468 0002 c4b0 0081 000c 0000 0000
0244200 ffff ffff 0200 2c07 0000 001f 0000 0008 0003 6c34 0003 6c34 0081 0012 0000 0000 ffff ffff 0200 2c0f 0000 001f 0000 0008
0244260 0003 ad24 0003 a424 0081 0017 0000 0000 ffff ffff 0100 2c1f 0000 31c7 0000 0004 0005 bc44 0005 bc44 0081 003f 0000 0000
0244340 ffff ffff 0000 2c27 0000 2c27 0000 0000 0005 a654 0005 a654 0081 003c 0000 0000 0008 d76c 0000 2c27 0000 3287 0000 0000
0244420 0005 a0cc 0005 a0cc 00c1 003a 0000 0000 ffff ffff 0000 2c37 0000 2c27 0000 0000 0005 a6cc 0005 a6cc 0081 003c 0000 0000
0244500 0008 d7ac 0000 2c37 0000 3287 0000 0000 0005 a0dc 0005 a0dc 00c1 003a 0000 0000 0008 d7cc 0100 2c37 0000 2c27 0000 0004
0244560 0005 a4e4 0005 a4e4 00a1 003b 0000 0000 ffff ffff 0100 2c3f 0000 001f 0000 0004 0003 b07c 0003 b07c 0081 0017 0000 0000
0244640 ffff ffff 0100 2c47 0000 001f 0000 0004 0003 c3d4 0003 c3d4 00a1 0018 0000 0000 0008 d82c 0200 2c47 0000 001f 0000 0008
0244720 0003 2618 0003 2640 0081 0010 0000 0000 ffff ffff 0100 2ca7 0000 2c27 0000 0004 0005 abec 0005 abec 0081 003c 0000 0000
0245000 ffff ffff 0100 2ccf 0000 001f 0000 0004 0003 cc4c 0003 cc4c 0081 001a 0000 0000 0008 d88c 0200 2ccf 0000 001f 0000 0008
0245060 0003 cc6c 0003 cc98 0081 001a 0000 0000 0008 d8ac 0400 2ccf 0000 001f 0000 0010 0003 ccc0 0003 cd10 0081 001a 0000 0000
0245140 ffff ffff 0300 2cd7 0000 001f 0000 000c 0003 cdcc 0003 ce0c 0081 001a 0000 0000 0008 b0cc 0300 2cdf 0000 2c27 0000 000c
0245220 0005 aa5c 0005 aa90 0081 003c 0000 0000 0008 d90c 0300 2cdf 0000 3287 0000 000c 0005 a19c 0005 a19c 00c1 003a 0000 0000
0245300 0008 b0ec 0300 2ce7 0000 2c27 0000 000c 0005 b75c 0005 b76c 0081 003c 0000 0000 0008 b10c 0300 2cef 0000 27c7 0000 000c
0245360 0005 f16c 0005 f16c 0081 0043 0000 0000 0008 d96c 0300 2cef 0000 3287 0000 000c 0005 a33c 0005 a33c 00c1 003a 0000 0000
0245440 ffff ffff 0300 2cf7 0000 2c27 0000 000c 0005 a5a4 0005 a5a4 00a1 003b 0000 0000 ffff ffff 0100 2cff 0000 2c27 0000 0004
0245520 0005 b6ec 0005 b6ec 0081 003c 0000 0000 ffff ffff 0100 2d07 0000 2c27 0000 0004 0005 b6d0 0005 b6d0 0081 003c 0000 0000
0245600 ffff ffff 0100 2d0f 0000 001f 0000 0004 0003 4958 0003 4958 0081 0012 0000 0000 0008 b12c 0300 2d17 0000 001f 0000 000c
0245660 0002 6718 0002 6718 0081 0003 0000 0000 0008 b16c 0300 2d1f 0000 001f 0000 000c 0002 67b4 0002 68c8 0081 0003 0000 0000
0245740 0008 b18c 0300 2d27 0000 001f 0000 000c 0002 6730 0002 6730 0081 0003 0000 0000 0008 b1ec 0000 2d37 0000 001f 0000 0000
0246020 0005 7674 0005 7674 0081 0035 0000 0000 0008 b20c 0000 2d3f 0000 001f 0000 0000 0005 7914 0005 7914 0081 0035 0000 0000
0246100 0008 b24c 0000 2d4f 0000 001f 0000 0000 0003 ae78 0003 ae84 0081 0017 0000 0000 ffff ffff 0100 2d5f 0000 001f 0000 0004
0246160 0003 ae04 0003 ae04 0081 0017 0000 0000 0008 daec 0200 2d5f 0000 002f 0000 0008 0005 8bb8 0005 8bb8 0081 0037 0000 0000
0246240 0008 b2cc 0000 2d6f 0000 001f 0000 0000 0005 76a0 0005 76a0 0081 0035 0000 0000 0008 b30c 0100 2d77 0000 001f 0000 0004
0246320 0002 5f2c 0002 5f80 0081 0003 0000 0000 0008 b34c 0200 2d7f 0000 001f 0000 0008 0002 5fa0 0002 5fa0 0081 0003 0000 0000
```

```
0246400  ffff ffff 0100 2d87 000c 001f 0000 0004 0002 64cc 0002 651c 0081 0003 0000 0000 0008 b36c 0200 2d8f 0000 001f 0000 0008
0246460  0002 653c 0002 653c 0081 0003 0000 0000 ffff ffff 0200 2d97 0000 2c27 0000 0008 0005 ab1c 0005 ab1c 0081 003c 0000 0000
0246540  0008 b38c 0200 2d9f 0000 001f 0000 0008 0003 af70 0003 af70 0081 0017 0000 0000 ffff ffff 0100 2dcf 0000 001f 0000 0004
0246620  0003 ad80 0003 ad80 0081 0017 0000 0000 0008 dc0c 0200 2dcf 0000 001f 0000 0008 0003 ad90 0003 ad90 0081 0017 0000 0000
0246700  0008 ad0c 0100 2ddf 0000 001f 0000 0004 0003 ad40 0003 ad40 0081 0017 0000 0000 0008 b40c 0100 2def 0000 217f 0000 0004
0246760  0005 b7cc 0005 b7cc 0081 003e 0000 0000 0008 dc6c 0100 2def 0000 31c7 0000 0004 0005 bb4c 0005 bb4c 0081 003f 0000 0000
0247040  0008 dc8c 0100 2def 0000 1ea7 0000 0004 0005 e14c 0005 e14c 0081 0041 0000 0000 0008 b58c 0100 2e07 0000 001f 0000 0004
0247120  0003 2a24 0003 2b4c 0081 0010 0000 0000 0008 adac 0100 2e0f 0000 001f 0000 0004 0003 2c10 0003 2c10 0081 0010 0000 0000
0247200  0008 b5cc 0003 2e17 0000 001f 0000 0000 0003 2c44 0003 2c44 0081 0010 0000 0000 0008 b5ec 0200 2e1f 0000 2c27 0000 0008
0247260  0005 a8c4 0005 a9f8 0081 003c 0000 0000 0008 dd2c 0200 2e1f 0000 3287 0000 0008 000c 1d5c 000c 1d5c 0041 0000 0000 0000
0247340  0008 dd4c 0300 2e1f 0000 2c27 0000 000c 0005 a86c 0005 a8a8 0081 003c 0000 0000 0008 dd6c 0300 2e1f 0000 3287 0000 000c
0247420  000c 1d6c 000c 1d6c 0041 0000 0000 0000 0008 b60c 0300 2e27 0000 2c27 0000 000c 0005 b690 0005 b6a0 0081 003c 0000 0000
0247500  0008 ae2c 0200 2e2f 0000 27c7 0000 0008 0005 ef2c 0005 ef2c 0081 0043 0000 0000 0008 ddcc 0200 2e2f 0000 3287 0000 0008
0247560  0005 a2cc 0005 a2cc 00c1 003a 0000 0000 0008 d1ec 0300 2e2f 0000 27c7 0000 000c 0005 ef58 0005 ef58 0081 0043 0000 0000
0247640  0008 de0c 0300 2e2f 0000 3287 0000 000c 0005 a2dc 0005 a2dc 00c1 003a 0000 0000 ffff ffff 0300 2e37 0000 2c27 0000 000c
0247720  0005 b38c 0005 b38c 0081 003c 0000 0000 0008 de4c 0300 2e37 0000 3287 0000 000c 0005 a1ec 0005 a1ec 00c1 003a 0000 0000
0250000  ffff ffff 0200 2e3f 0000 2c27 0000 0008 0005 a550 0005 a550 00a1 003b 0000 0000 0008 ae4c 0100 2e47 0000 2c27 0000 0004
0250060  0005 b648 0005 b648 0081 003c 0000 0000 ffff ffff 0100 2e4f 0000 2c27 0000 0004 0005 a538 0005 a538 00a1 003b 0000 0000
0250140  0008 ae6c 0200 2e57 0000 27c7 0000 0008 0005 ebcc 0005 ec9c 0081 0043 0000 0000 0008 deec 0200 2e57 0000 3287 0000 0008
0250220  0005 a28c 0005 a28c 00c1 003a 0000 0000 0008 df0c 0300 2e57 0000 27c7 0000 000c 0005 ecac 0005 ed6c 0081 0043 0000 0000
0250300  0008 df2c 0300 2e57 0000 3287 0000 000c 0005 a29c 0005 a29c 00c1 003a 0000 0000 0008 b62c 0200 2e5f 0000 1dff 0000 0008
0250360  0005 f72c 0005 f73c 0081 0044 0000 0000 0008 b64c 0200 2e67 0000 2c27 0000 0008 0005 a96c 0005 a9a0 0081 003c 0000 0000
0250440  0008 df8c 0200 2e67 0000 3287 0000 0008 0005 a15c 0005 a15c 00c1 003a 0000 0000 0008 dfac 0300 2e67 0000 2c27 0000 000c
0250520  0005 a914 0005 a950 0081 003c 0000 0000 0008 dfcc 0300 2e67 0000 3287 0000 000c 0005 a16c 0005 a16c 00c1 003a 0000 0000
0250600  0008 aecc 0200 2e6f 0000 27c7 0000 0008 0005 ef84 0005 ef84 0081 0043 0000 0000 0008 e00c 0200 2e6f 0000 3287 0000 0008
0250660  0005 a2ec 0005 a2ec 00c1 003a 0000 0000 0008 e02c 0300 2e6f 0000 27c7 0000 000c 0005 efb0 0005 efb0 0081 0043 0000 0000
0250740  0008 e04c 0300 2e6f 0000 3287 0000 000c 0005 a2fc 0005 a2fc 00c1 003a 0000 0000 ffff ffff 0200 2e77 0000 27c7 0000 0008
0251020  0005 ed7c 0005 ee4c 0081 0043 0000 0000 0008 e08c 0200 2e77 0000 3287 0000 0008 0005 a2ac 0005 a2ac 00c1 003a 0000 0000
0251100  0008 e0ac 0300 2e77 0000 27c7 0000 000c 0005 ee5c 0005 ef1c 0081 0043 0000 0000 0008 e0cc 0300 2e77 0000 3287 0000 000c
0251160  0005 a2bc 0005 a2bc 00c1 003a 0000 0000 0008 aeec 0100 2e7f 0000 2c27 0000 0004 0005 b41c 0005 b41c 0081 003c 0000 0000
0251240  ffff ffff 0200 2e87 0000 2c27 0000 0008 0005 a5fc 0005 a5fc 00a1 003b 0000 0000 ffff ffff 0100 2e8f 0000 2c27 0000 0004
0251320  0005 a5c8 0005 a5c8 00a1 003b 0000 0000 ffff ffff 0100 2e97 0000 001f 0000 0004 0003 2330 0003 2354 0081 0010 0000 0000
0251400  0008 b74c 0100 2ea7 0000 001f 0000 0004 0003 2374 0003 2398 0081 0010 0000 0000 0008 b78c 0300 2eaf 0000 001f 0000 000c
0251460  0003 e8f4 0003 e8f4 0081 001c 0000 0000 ffff ffff 0400 2eb7 0000 004f 0000 0010 000a 18f0 000b e0f0 0013 003a 0000 0000
0251540  ffff ffff 0200 2ebf 0000 001f 0000 0008 0004 3e94 0004 3e94 00a1 0025 0000 0000 ffff ffff 0300 2ecf 0000 31c7 0000 000c
0251620  0005 c094 0005 c094 0081 003f 0000 0000 0008 e20c 0400 2ecf 0000 31c7 0000 0010 0005 c07c 0005 c07c 0081 003f 0000 0000
0251700  ffff ffff 0100 2edf 0000 31c7 0000 0004 0005 bca4 0005 bca4 0081 003f 0000 0000 ffff ffff 0100 2ef7 0000 001f 0000 0004
0251760  0003 29f4 0003 29f4 0081 0010 0000 0000 0008 e26c 0200 2ef7 0000 001f 0000 0008 0003 2984 0003 29cc 0081 0010 0000 0000
0252040  0008 b82c 0200 2f1f 0000 001f 0000 0008 0002 7329 0002 7364 0081 0004 0000 0000 0008 e2ac 0400 2f1f 0000 001f 0000 0010
0252120  0002 7388 0002 7448 0081 0004 0000 0000 ffff ffff 0100 2f2f 0000 001f 0000 0004 0003 f64c 0003 f64c 0081 001d 0000 0000
0252200  0008 e2ec 0200 2f2f 0000 001f 0000 0008 0003 f670 0003 f670 0081 001d 0000 0000 0008 e30c 0400 2f2f 0000 001f 0000 0010
0252260  0003 f6dc 0003 f720 0081 001d 0000 0000 ffff ffff 0200 2f37 0000 0057 0000 0008 000a 18f0 000a d038 0003 0000 0000 0000
0252340  0008 b8ac 0100 2f4f 0000 0027 0000 0004 0004 84dc 0004 84dc 0081 0029 0000 0000 0008 e36c 0200 2f4f 0000 0027 0000 0008
0252420  0004 84f4 0004 84f4 0081 0029 0000 0000 0008 e38c 0300 2f4f 0000 0027 0000 000c 0004 857c 0004 85f4 0081 0029 0000 0000
0252500  0008 b92c 0000 2f8f 0000 001f 0000 0000 0004 03c8 0004 03c8 0081 001f 0000 0000 0008 e3cc 0200 2f8f 0000 001f 0000 0008
0252560  0004 020c 0004 020c 0081 001f 0000 0000 0008 b94c 0200 2fa7 0000 001f 0000 0008 0005 5034 0005 5034 0081 0032 0000 0000
0252640  0008 b96c 0200 2fb7 0000 001f 0000 0008 0003 3220 0003 3220 0081 0010 0000 0000 ffff ffff 0200 2fbf 0000 001f 0000 0008
0252720  0003 250c 0003 250c 0081 0010 0000 0000 0008 e44c 0300 2fbf 0000 001f 0000 000c 0003 3398 0003 3410 0081 0010 0000 0000
0253000  0008 b9cc 0400 2fe7 0000 1ea7 0000 0010 0005 e184 0005 e1dc 0081 0041 0000 0000 ffff ffff 0100 2fef 0000 001f 0000 0004
0253060  0004 0e4c 0004 0e4c 0081 0021 0000 0000 0008 ba0c 0100 2ff7 0000 0027 0000 0004 0004 7f28 0004 7f28 0081 0029 0000 0000
0253140  0008 ba2c 0200 2fff 0000 001f 0000 0008 0003 ae3c 0003 ae3c 0081 0017 0000 0000 0008 af6c 0100 3007 0000 1dff 0000 0004
0253220  0005 fbe4 0005 fbe4 0081 0044 0000 0000 0008 e50c 0200 3007 0000 1dff 0000 0008 0005 fc44 0005 fc44 0081 0044 0000 0000
0253300  0008 ac8c 0200 300f 0000 1dff 0000 0008 0005 fcc8 0005 fcc8 0081 0044 0000 0000 ffff ffff 0100 301f 0000 31c7 0000 0004
0253360  0005 bcc4 0005 bcc4 0081 003f 0000 0000 0008 baac 0200 3037 0000 001f 0000 0008 0003 cb84 0003 cb84 00a1 0018 0000 0000
0253440  0008 baec 0100 3047 0000 001f 0000 0004 0003 27ec 0003 27ec 0081 0010 0000 0000 0008 e5ac 0200 3047 0000 001f 0000 0008
```

```
0253520  0003 2790 0003 27c4 0081 0010 0000 0000 0008 bb4c 0300 3057 0000 1dff 0000 000c 0005 f920 0005 f920 0081 0044 0000 0000
0253600  0008 e5ec 0400 3057 0000 1dff 0000 0010 0005 f9e0 0005 f9e0 0081 0044 0000 0000 0008 e60c 0500 3057 0000 1dff 0000 0014
0253660  0005 f944 0005 f944 0081 0044 0000 0000 0008 e52c 0600 3057 0000 1dff 0000 0018 0005 fa04 0005 fa04 0081 0044 0000 0000
0253740  0008 bb6c 0400 305f 0000 1dff 0000 0010 0005 fad8 0005 fad8 0081 0044 0000 0000 0008 e66c 0600 305f 0000 1dff 0000 0018
0254020  0005 fafc 0005 fafc 0081 0044 0000 0000 0008 bb8c 0100 3067 0000 001f 0000 0004 0003 2c64 0003 2dac 0081 0010 0000 0000
0254100  0008 bbcc 0100 306f 0000 001f 0000 0004 0003 2e70 0003 2e70 0081 0010 0000 0000 0008 bc4c 0200 308f 0000 3287 0000 0008
0254160  000a 18f0 000a 18f0 0000 0000 0000 0000 0008 bc8c 0200 309f 0000 31c7 0000 0008 0005 bcd4 0005 bcd4 0081 003f 0000 0000
0254240  ffff ffff 0200 30a7 0000 31c7 0000 0008 0005 bd3c 0005 bd3c 0081 003f 0000 0000 ffff ffff 0000 30e7 0000 001f 0000 0000
0254320  0003 2ea4 0003 2ea4 0081 0010 0000 0000 ffff ffff 0000 310f 0000 0027 0000 0000 0004 8444 0004 8444 0081 0029 0000 0000
0254400  0008 e76c 0800 310f 0000 0027 0000 0020 0004 6020 0004 61f8 0081 0029 0000 0000 0008 bd8c 0300 311f 0000 001f 0000 000c
0254460  0004 294c 0004 2c50 0081 0025 0000 0000 ffff ffff 0200 312f 0000 2c27 0000 0008 0005 b000 0005 b000 0081 003c 0000 0000
0254540  0008 e7cc 0200 312f 0000 3287 0000 0008 0005 a21c 0005 a21c 00c1 003a 0000 0000 ffff ffff 0200 3137 0000 2c27 0000 0008
0254620  0005 a56c 0005 a56c 00a1 003b 0000 0000 0008 b1ac 0000 3157 0000 001f 0000 0000 0003 c6bc 0003 c6bc 00a1 0018 0000 0000
0254700  ffff ffff 0000 315f 0000 001f 0000 0000 0003 997c 0003 997c 0081 0015 0000 0000 ffff ffff 0100 316f 0000 001f 0000 0004
0254760  0003 79a4 0003 79a4 0081 0014 0000 0000 0008 e96c 0200 316f 0000 001f 0000 0008 0003 79f0 0003 79f0 0081 0014 0000 0000
0255040  0008 bdcc 0000 3177 0000 001f 0000 0000 0003 3020 0003 3020 0081 0010 0000 0000 0008 be0c 0100 317f 0000 001f 0000 0004
0255120  0003 2f90 0003 2f90 0081 0010 0000 0000 0008 be2c 0100 3187 0000 001f 0000 0004 0003 2fa8 0003 2fa8 0081 0010 0000 0000
0255200  ffff ffff 0000 318f 0000 001f 0000 0000 0003 2ff0 0003 2ff0 0081 0010 0000 0000 0008 be4c 0100 3197 0000 001f 0000 0004
0255260  0003 3008 0003 3008 0081 0010 0000 0000 ffff ffff 0100 319f 0000 001f 0000 0004 0003 2fc0 0003 2fc0 0081 0010 0000 0000
0255340  ffff ffff 0100 31a7 0000 001f 0000 0004 0003 2fd8 0003 2fd8 0081 0010 0000 0000 ffff ffff 0500 31af 0000 31c7 0000 0014
0255420  0005 c0c0 0005 c3b8 0081 003f 0000 0000 0008 be6c 0100 31b7 0000 004f 0000 0004 000a 18f0 0007 e524 0003 0000 0000 0000
0255500  0008 be8c 0200 31bf 0000 31c7 0000 0008 0005 c48c 0005 c48c 0081 003f 0000 0000 ffff ffff 0100 3237 0000 001f 0000 0004
0255560  0004 3f08 0004 3f2c 0081 0026 0000 0000 ffff ffff 0200 323f 0000 001f 0000 0008 0002 d15c 0002 d1a8 0081 000c 0000 0000
0255640  ffff ffff 0300 3247 0000 3287 0000 000c 000a 18f0 000a 18f0 0000 0000 0000 0000 0008 bf2c 0100 324f 0000 2c27 0000 0004
0255720  0005 a3d8 0005 a3d8 0081 003d 0000 0000 0008 bfec 0100 3277 0000 001f 0000 0004 0003 4980 0003 4980 0081 0012 0000 0000
0256000  0008 ea6c 0200 3277 0000 001f 0000 0008 0003 4998 0003 49b8 0081 0012 0000 0000 0008 ea8c 0300 3277 0000 001f 0000 000c
0256060  0003 49c8 0003 4a04 0081 0012 0000 0000 0008 c04c 0400 3297 0000 3287 0000 0010 000a 18f0 000a 18f0 0000 0000 0000 0000
0256140  0008 c96c 0000 329f 0000 3287 0000 0000 000a 18f0 000a 18f0 0000 0000 0000 0000 ffff ffff 0100 32b7 0000 004f 0000 0004
0256220  000a 18f0 0007 e02c 0013 003b 0000 0000 ffff ffff 0300 32bf 0000 005f 0000 000c 000a 18f0 0007 9494 0003 0013 0000 0000
0256300  ffff ffff 0100 32d7 0000 2c27 0000 0004 0005 a428 0005 a428 0081 003d 0000 0000 ffff ffff 0100 32df 0000 001f 0000 0004
0256360  0003 9698 0003 9698 0081 0015 0000 0000 ffff ffff 0000 3317 0000 001f 0000 0000 0003 b138 0003 b200 0081 0017 0000 0000
0256440  0008 eb8c 0100 3317 0000 001f 0000 0004 0003 b20c 0003 b234 0081 0017 0000 0000 0008 c12c 0100 331f 0000 001f 0000 0004
0256520  0004 4168 0004 4168 0081 0026 0000 0000 0008 ebcc 0200 331f 0000 001f 0000 0008 0004 4188 0004 4188 0081 0026 0000 0000
0256600  0008 c18c 0100 3387 0000 001f 0000 0004 0004 41cc 0004 41cc 0081 0027 0000 0000 0008 ec0c 0200 3387 0000 001f 0000 0008
0256660  0004 41fc 0004 41fc 0081 0027 0000 0000 ffff ffff 0100 339f 0000 001f 0000 0004 0002 7f38 0002 7f38 0081 0007 0000 0000
0256740  0008 ec4c 0200 339f 0000 001f 0000 0008 0002 7f50 0002 7f80 0081 0007 0000 0000 0008 c20c 0100 33a7 0000 001f 0000 0004
0257020  0004 4248 0004 4248 0081 0027 0000 0000 0008 ec8c 0200 33a7 0000 001f 0000 0008 0004 4278 0004 4278 0081 0027 0000 0000
0257100  ffff ffff 0400 33b7 0000 0057 0000 0010 000a 18f0 0002 438a 0003 0000 0000 0000 0006 369e 01ff ffff 0006 0830 01ff ffff
0257160  0006 840a 0000 0000 0006 840a 01ff ffff 0006 840a 01ff ffff 0006 840a 01ff ffff 0006 840a 01ff ffff 0006 840a 01ff ffff
0257240  0006 840a 01ff ffff 0006 840a 01ff ffff 0006 840a 01ff ffff 0006 840a 01ff ffff 0006 840a 01ff ffff 0006 840a 01ff ffff
0257320  0006 840a 0000 0000 0006 840a 0000 0000 0006 840a 0000 0000 0006 840a 0000 0000 0006 840a 0000 0000 0006 840a 0000 0000
*
0262460  0006 840a 0000 0000 0005 fd8a 01ff ffff 0005 f18e 01ff ffff 0005 fd94 01ff ffff 0005 fd9c 01ff ffff 0005 fdc2 01ff ffff
0262540  0005 fe0a 0100 00df 0005 fe54 01ff ffff 0005 feac 01ff ffff 0005 febc 01ff ffff 0005 fee6 01ff ffff 0005 ff2c 01ff ffff
0262620  0005 ff6e 01ff ffff 0005 ff98 01ff ffff 0005 ffbe 0100 00e7 0005 ffe4 01ff ffff 0006 0016 01ff ffff 0006 005a 0100 00ea
0262700  0006 009c 0100 00eb 0006 00e0 01ff ffff 0006 012a 01ff ffff 0006 0174 01ff ffff 0006 01bc 01ff ffff 0006 0204 01ff ffff
0262760  0006 0252 01ff ffff 0006 026c 01ff ffff 0006 0272 01ff ffff 0006 0280 01ff ffff 0006 028e 01ff ffff 0006 02a0 01ff ffff
0263040  0006 02b4 01ff ffff 0006 02be 01ff ffff 0006 02c4 01ff ffff 0006 02ca 01ff ffff 0006 02d0 01ff ffff 0006 02d8 0100 00f8
0263120  0006 02e2 01ff ffff 0006 032e 01ff ffff 0006 0334 01ff ffff 0006 033a 01ff ffff 0006 0340 01ff ffff 0006 0348 01ff ffff
0263200  0006 0356 01ff ffff 0006 0364 01ff ffff 0006 0374 01ff ffff 0006 037e 01ff ffff 0006 0382 01ff ffff 0006 03d2 01ff ffff
0263260  0006 03fe 01ff ffff 0006 0402 01ff ffff 0006 0408 01ff ffff 0006 040e 01ff ffff 0006 0416 01ff ffff 0006 041e 01ff ffff
0263340  0006 0424 01ff ffff 0006 0442 01ff ffff 0006 0464 01ff ffff 0006 0484 01ff ffff 0006 04c8 01ff ffff 0006 04cc 0100 0111
0263420  0006 04d0 01ff ffff 0006 04e0 01ff ffff 0006 04ee 01ff ffff 0006 0508 01ff ffff 0006 051c 01ff ffff 0006 0534 01ff ffff
0263500  0006 054c 01ff ffff 0006 055e 01ff ffff 0006 0580 01ff ffff 0006 0598 01ff ffff 0006 05b0 01ff ffff 0006 05c4 01ff ffff
0263560  0006 05d6 01ff ffff 0006 05e4 01ff ffff 0006 05ec 01ff ffff 0006 05f4 01ff ffff 0006 0600 01ff ffff 0006 060e 01ff ffff
```

```
0263640  0006 061a 01ff ffff 0006 062e 01ff ffff 0006 0642 01ff ffff 0006 0648 01ff ffff 0006 0650 01ff ffff 0006 0656 01ff ffff
0263720  0006 065c 01ff ffff 0006 0670 0100 00e4 0006 0676 01ff ffff 0006 067c 01ff ffff 0006 0684 01ff ffff 0006 068a 01ff ffff
0264000  0006 0690 01ff ffff 0006 0696 01ff ffff 0006 06a2 01ff ffff 0006 06aa 01ff ffff 0006 06b0 01ff ffff 0006 06b6 01ff ffff
0264060  0006 06c0 01ff ffff 0006 06d4 01ff ffff 0006 06da 01ff ffff 0006 06ea 01ff ffff 0006 06f2 01ff ffff 0006 06f6 01ff ffff
0264140  0006 06fa 01ff ffff 0006 0700 01ff ffff 0006 0704 01ff ffff 0006 070e 01ff ffff 0006 071a 01ff ffff 0006 0728 0100 0125
0264220  0006 0734 01ff ffff 0006 0742 01ff ffff 0006 074e 01ff ffff 0006 075a 01ff ffff 0006 0764 0100 010c 0006 0772 01ff ffff
0264300  0006 077c 01ff ffff 0006 078a 01ff ffff 0006 0796 01ff ffff 0006 07aa 01ff ffff 0006 07ae 01ff ffff 0006 07b2 0100 0100
0264360  0006 07b8 0100 00f7 0006 07d0 01ff ffff 0006 07e4 01ff ffff 0006 07f2 01ff ffff 0006 07f8 01ff ffff 0006 07fc 01ff ffff
0264440  0006 0800 01ff ffff 0006 0806 01ff ffff 0006 080e 01ff ffff 0006 0812 01ff ffff 0006 0818 01ff ffff 0006 081e 01ff ffff
0264520  0006 0824 0100 013b 0006 082a 01ff ffff 0006 0834 01ff ffff 0006 083a 01ff ffff 0006 0842 01ff ffff 0006 0848 01ff ffff
0264600  0006 0850 01ff ffff 0006 0856 01ff ffff 0006 085c 01ff ffff 0006 0862 01ff ffff 0006 0866 01ff ffff 0006 086c 0100 010a
0264660  0006 089e 01ff ffff 0006 08a4 01ff ffff 0006 08aa 01ff ffff 0006 08dc 01ff ffff 0006 090c 01ff ffff 0006 093e 01ff ffff
0264740  0006 0970 01ff ffff 0006 09a4 01ff ffff 0006 09d4 01ff ffff 0006 0a06 01ff ffff 0006 0a36 01ff ffff 0006 0a68 01ff ffff
0265020  0006 0a9c 01ff ffff 0006 0ace 01ff ffff 0006 0afe 01ff ffff 0006 0b2e 0100 016d 0006 0b60 01ff ffff 0006 0b90 01ff ffff
0265100  0006 0bc0 01ff ffff 0006 0bf0 01ff ffff 0006 0c22 01ff ffff 0006 0c50 01ff ffff 0006 0c84 01ff ffff 0006 0cb0 01ff ffff
0265160  0006 0ce2 0100 0119 0006 0d14 01ff ffff 0006 0d44 01ff ffff 0006 0d74 01ff ffff 0006 0da6 0100 0165 0006 0dd4 0100 00f0
0265240  0006 0e08 01ff ffff 0006 0e3a 01ff ffff 0006 0e6a 0100 017b 0006 0e9a 0100 0175 0006 0ece 01ff ffff 0006 0f04 01ff ffff
0265320  0006 0f38 01ff ffff 0006 0f6c 01ff ffff 0006 0fa2 01ff ffff 0006 0fd4 0100 0189 0006 1008 01ff ffff 0006 1038 01ff ffff
0265400  0006 1066 01ff ffff 0006 1098 0100 018a 0006 10ca 01ff ffff 0006 10fa 01ff ffff 0006 112a 01ff ffff 0006 115c 0100 0198
0265460  0006 118c 01ff ffff 0006 11c0 01ff ffff 0006 11f4 0100 010b 0006 1228 0100 0185 0006 125c 01ff ffff 0006 128c 01ff ffff
0265540  0006 12be 01ff ffff 0006 12f0 01ff ffff 0006 1324 01ff ffff 0006 1352 01ff ffff 0006 1384 01ff ffff 0006 13b2 01ff ffff
0265620  0006 13e2 01ff ffff 0006 142c 01ff ffff 0006 1478 01ff ffff 0006 14c2 01ff ffff 0006 14ca 01ff ffff 0006 14fa 0100 019a
0265700  0006 1522 0100 01aa 0006 1556 01ff ffff 0006 158a 0100 01ac 0006 15b4 01ff ffff 0006 15e0 0100 01a7 0006 160a 01ff ffff
0265760  0006 1614 01ff ffff 0006 161a 01ff ffff 0006 165c 01ff ffff 0006 1684 0100 00e3 0006 1688 01ff ffff 0006 168e 01ff ffff
0266040  0006 16ba 01ff ffff 0006 16f4 01ff ffff 0006 1748 01ff ffff 0006 174e 01ff ffff 0006 1752 01ff ffff 0006 1756 01ff ffff
0266120  0006 175c 01ff ffff 0006 1760 01ff ffff 0006 1766 01ff ffff 0006 176c 01ff ffff 0006 1772 01ff ffff 0006 1778 01ff ffff
0266200  0006 177e 01ff ffff 0006 1782 01ff ffff 0006 1788 0100 016b 0006 178e 01ff ffff 0006 1792 01ff ffff 0006 1798 01ff ffff
0266260  0006 179c 01ff ffff 0006 17a2 01ff ffff 0006 17a8 01ff ffff 0006 17ae 01ff ffff 0006 17b4 0100 0168 0006 17ea 01ff ffff
0266340  0006 17ee 01ff ffff 0006 17f6 01ff ffff 0006 1842 01ff ffff 0006 1858 01ff ffff 0006 188a 01ff ffff 0006 18a2 0100 01d4
0266420  0006 18ba 01ff ffff 0006 18e4 01ff ffff 0006 190a 01ff ffff 0006 1938 0100 0166 0006 1966 01ff ffff 0006 1992 01ff ffff
0266500  0006 19ba 0100 01d8 0006 19e4 01ff ffff 0006 1a0e 0100 0103 0006 1a3e 01ff ffff 0006 1a66 01ff ffff 0006 1a8c 0100 0121
0266560  0006 1aba 01ff ffff 0006 1b08 0100 0135 0006 1b28 0100 01d0 0006 1b3e 01ff ffff 0006 1b62 01ff ffff 0006 1b6a 01ff ffff
0266640  0006 1b80 01ff ffff 0006 1b88 01ff ffff 0006 1bb6 01ff ffff 0006 1bf9 01ff ffff 0006 1c48 01ff ffff 0006 1c94 01ff ffff
0266720  0006 1cc2 01ff ffff 0006 1cf0 0100 01ee 0006 1d24 0100 01ef 0006 1d50 0100 01f0 0006 1d80 01ff ffff 0006 1dbc 01ff ffff
0267000  0006 1e02 01ff ffff 0006 1e46 01ff ffff 0006 1e7c 0100 01f3 0006 1eb8 01ff ffff 0006 1efe 01ff ffff 0006 1f42 0100 01f6
0267060  0006 1f88 01ff ffff 0006 1fce 0100 01f9 0006 2004 01ff ffff 0006 204a 01ff ffff 0006 208a 0100 01fd 0006 20ca 0100 01fb
0267140  0006 2112 0100 00fb 0006 216c 01ff ffff 0006 219c 0100 0131 0006 21dc 01ff ffff 0006 221c 0100 0202 0006 2246 0100 0119
0267220  0006 2276 0100 019d 0006 22c0 0100 0206 0006 230e 01ff ffff 0006 2354 01ff ffff 0006 2386 0100 0209 0006 23bc 01ff ffff
0267300  0006 23ee 0100 01ff 0006 2438 0100 01fc 0006 2476 0100 01f8 0006 24c8 01ff ffff 0006 24f8 01ff ffff 0006 252c 01ff ffff
0267360  0006 2534 01ff ffff 0006 2554 01ff ffff 0006 2572 01ff ffff 0006 2590 01ff ffff 0006 25b0 01ff ffff 0006 2614 0100 014e
0267440  0006 261e 01ff ffff 0006 2652 0100 01b8 0006 2680 0100 0205 0006 26a2 01ff ffff 0006 26a8 0100 01ab 0006 26b2 01ff ffff
0267520  0006 26fc 01ff ffff 0006 2712 0100 017e 0006 2728 01ff ffff 0006 273e 01ff ffff 0006 2754 01ff ffff 0006 2760 01ff ffff
0267600  0006 2768 01ff ffff 0006 276e 0100 011d 0006 2786 01ff ffff 0006 278e 01ff ffff 0006 27a0 01ff ffff 0006 27c6 0100 0112
0267660  0006 280c 01ff ffff 0006 2828 01ff ffff 0006 282c 01ff ffff 0006 2838 01ff ffff 0006 2844 01ff ffff 0006 2850 01ff ffff
0267740  0006 285c 01ff ffff 0006 2868 01ff ffff 0006 2874 01ff ffff 0006 2880 01ff ffff 0006 288c 01ff ffff 0006 2898 01ff ffff
0270020  0006 28a4 0100 022e 0006 28b0 0100 022f 0006 28bc 0100 0230 0006 28c8 0100 0231 0006 28d4 0100 0232 0006 28e0 0100 0233
0270100  0006 28ec 0100 0234 0006 28f8 0100 0235 0006 2904 01ff ffff 0006 2910 01ff ffff 0006 291c 0100 0238 0006 2928 0100 0239
0270160  0006 2934 0100 023a 0006 2940 0100 023b 0006 294c 0100 023c 0006 2958 0100 023d 0006 2964 0100 023e 0006 2970 0100 023f
0270240  0006 297c 01ff ffff 0006 2988 01ff ffff 0006 2994 0100 0242 0006 29a0 0100 0243 0006 29ac 0100 0244 0006 29b8 0100 0245
0270320  0006 29c4 0100 0246 0006 29d0 0100 0247 0006 29dc 0100 0248 0006 29e8 0100 0249 0006 29f4 01ff ffff 0006 2a00 01ff ffff
0270400  0006 2a0c 0100 024c 0006 2a18 0100 024d 0006 2a24 0100 024e 0006 2a30 0100 024f 0006 2a3c 0100 0250 0006 2a48 0100 0251
0270460  0006 2a54 0100 0252 0006 2a60 0100 0253 0006 2a6c 01ff ffff 0006 2a78 01ff ffff 0006 2a84 0100 0256 0006 2a90 0100 0257
0270540  0006 2a9c 0100 0258 0006 2aa8 0100 0259 0006 2ab4 0100 025a 0006 2ac0 0100 025b 0006 2acc 0100 025c 0006 2ad8 0100 025d
0270620  0006 2ae4 01ff ffff 0006 2af0 01ff ffff 0006 2afc 0100 0260 0006 2b08 0100 0261 0006 2b14 0100 0262 0006 2b20 0100 0263
0270700  0006 2b2c 0100 0264 0006 2b38 0100 0265 0006 2b44 0100 0266 0006 2b50 0100 0267 0006 2b5c 01ff ffff 0006 2b68 01ff ffff
```

```
0270760 0006 2b74 0100 026a 0006 2b80 0100 026b 0006 2b8c 0100 026c 0006 2b98 0100 026d 0006 2ba4 0100 026e 0006 2bb0 0100 026f
0271040 0006 2bbc 0100 0270 0006 2bc8 0100 0271 0006 2bd4 01ff ffff 0006 2be0 01ff ffff 0006 2bec 0100 0274 0006 2bf8 0100 0275
0271120 0006 2c04 0100 0276 0006 2c10 0100 0277 0006 2c1c 0100 0278 0006 2c28 0100 0279 0006 2c34 0100 027a 0006 2c40 0100 027b
0271200 0006 2c4c 01ff ffff 0006 2c58 01ff ffff 0006 2c64 0100 027e 0006 2c70 0100 027f 0006 2c7c 0100 0280 0006 2c88 0100 0281
0271260 0006 2c94 0100 0282 0006 2ca0 0100 0283 0006 2cac 0100 0284 0006 2cb8 0100 0285 0006 2cc4 01ff ffff 0006 2cd0 01ff ffff
0271340 0006 2cdc 0100 0240 0006 2ce8 0100 0241 0006 2cf4 0100 024a 0006 2d00 0100 024b 0006 2d0c 0100 0254 0006 2d18 0100 0255
0271420 0006 2d24 0100 025e 0006 2d30 0100 025f 0006 2d3c 0100 0268 0006 2d48 0100 0269 0006 2d54 0100 0292 0006 2d60 0100 0293
0271500 0006 2d6c 0100 0294 0006 2d78 0100 0295 0006 2d84 0100 0296 0006 2d90 0100 0297 0006 2d9c 0100 0298 0006 2da8 0100 0299
0271560 0006 2db4 0100 0272 0006 2dc0 0100 0273 0006 2dcc 0100 029c 0006 2dd8 0100 029d 0006 2de4 0100 029e 0006 2df0 0100 029f
0271640 0006 2dfc 0100 02a0 0006 2e08 0100 02a1 0006 2e14 0100 02a2 0006 2e20 0100 02a3 0006 2e2c 0100 027c 0006 2e38 0100 027d
0271720 0006 2e44 0100 02a6 0006 2e50 01ff ffff 0006 2e78 0100 02af 0006 2ea0 0100 02b0 0006 2ec8 01ff ffff 0006 2ef6 0100 01e1
0272000 0006 2f28 01ff ffff 0006 2f30 01ff ffff 0006 2f38 0100 01ad 0006 2f4e 01ff ffff 0006 2f66 01ff ffff 0006 2f74 0100 022a
0272060 0006 2f88 01ff ffff 0006 2fb0 01ff ffff 0006 2fe2 01ff ffff 0006 3018 01ff ffff 0006 3028 01ff ffff 0006 3068 01ff ffff
0272140 0006 308a 01ff ffff 0006 30b2 01ff ffff 0006 30cc 0100 02bf 0006 30e6 01ff ffff 0006 312a 0100 02b9 0006 313e 01ff ffff
0272220 0006 317e 01ff ffff 0006 31ba 01ff ffff 0006 31f0 01ff ffff 0006 3232 01ff ffff 0006 3252 0100 02c6 0006 328c 01ff ffff
0272300 0006 3296 01ff ffff 0006 32c0 01ff ffff 0006 32e4 01ff ffff 0006 32e8 0100 00e9 0006 3300 0100 01e5 0006 3312 01ff ffff
0272360 0006 332e 01ff ffff 0006 3340 01ff ffff 0006 3372 01ff ffff 0006 337a 01ff ffff 0006 3396 01ff ffff 0006 33a4 0100 02c9
0272440 0006 33b4 0100 0133 0006 33e2 0100 012b 0006 3408 0100 02d8 0006 3424 01ff ffff 0006 3442 0100 02db 0006 3460 0100 0210
0272520 0006 3492 01ff ffff 0006 34b6 0100 02d3 0006 34ce 01ff ffff 0006 34e0 0100 02bd 0006 34f2 0100 00ec 0006 3518 01ff ffff
0272600 0006 353c 0100 0218 0006 357e 01ff ffff 0006 35aa 01ff ffff 0006 35da 01ff ffff 0006 360e 01ff ffff 0006 363e 01ff ffff
0272660 0006 3676 01ff ffff 0006 36a4 01ff ffff 0006 36c6 01ff ffff 0006 36ea 0100 02dc 0006 3700 01ff ffff 0006 3704 01ff ffff
0272740 0006 370a 01ff ffff 0006 3710 01ff ffff 0006 3716 01ff ffff 0006 371a 01ff ffff 0006 3720 01ff ffff 0006 3724 01ff ffff
0273020 0006 3762 0100 019f 0006 37a2 0100 01be 0006 37b0 01ff ffff 0006 37c0 01ff ffff 0006 37d2 0100 0120 0006 37e2 01ff ffff
0273100 0006 37f2 0100 022b 0006 37fe 01ff ffff 0006 380a 01ff ffff 0006 3814 01ff ffff 0006 381e 01ff ffff 0006 3828 0100 02ed
0273160 0006 3832 01ff ffff 0006 383c 01ff ffff 0006 384a 0100 0197 0006 385c 01ff ffff 0006 386e 01ff ffff 0006 3888 01ff ffff
0273240 0006 3898 01ff ffff 0006 38a8 01ff ffff 0006 38bc 01ff ffff 0006 38d2 01ff ffff 0006 38e2 0100 02c4 0006 38f2 0100 030b
0273320 0006 3908 01ff ffff 0006 391c 0100 02c3 0006 392e 01ff ffff 0006 3938 01ff ffff 0006 3950 01ff ffff 0006 3962 0100 0114
0273400 0006 3974 0100 0312 0006 3986 01ff ffff 0006 3998 01ff ffff 0006 39a8 01ff ffff 0006 39b8 01ff ffff 0006 39c8 01ff ffff
0273460 0006 39dc 01ff ffff 0006 39f6 0100 031a 0006 3a0a 0100 014a 0006 3a1a 0100 030d 0006 3a34 0100 031d 0006 3a4c 01ff ffff
0273540 0006 3a64 0100 030f 0006 3a74 0100 01a4 0006 3a7c 0100 01c9 0006 3a86 01ff ffff 0006 3a9c 0100 0306 0006 3ab4 01ff ffff
0273620 0006 3ac4 01ff ffff 0006 3ad0 01ff ffff 0006 3ae0 01ff ffff 0006 3af2 01ff ffff 0006 3b02 01ff ffff 0006 3b10 01ff ffff
0273700 0006 3b24 0100 00e6 0006 3b34 0100 0315 0006 3b46 01ff ffff 0006 3b5a 01ff ffff 0006 3b72 01ff ffff 0006 3b86 01ff ffff
0273760 0006 3b98 01ff ffff 0006 3bb2 0100 032e 0006 3bc6 0100 02e1 0006 3bce 01ff ffff 0006 3bdc 0100 0311 0006 3bf0 0100 032b
0274040 0006 3c04 0100 0225 0006 3c1e 0100 0320 0006 3c32 01ff ffff 0006 3c3e 0100 0319 0006 3c50 0100 031b 0006 3c68 0100 033c
0274120 0006 3c7a 01ff ffff 0006 3c8a 01ff ffff 0006 3c9a 01ff ffff 0006 3cae 0100 01b5 0006 3cbc 01ff ffff 0006 3cca 0100 020f
0274200 0006 3cda 0100 030c 0006 3cf0 01ff ffff 0006 3cfc 0100 00f9 0006 3d0c 01ff ffff 0006 3d1c 01ff ffff 0006 3d30 01ff ffff
0274260 0006 3d3c 01ff ffff 0006 3d4e 01ff ffff 0006 3d60 01ff ffff 0006 3d6a 01ff ffff 0006 3d7a 0100 033d 0006 3d8a 0100 01bf
0274340 0006 3d9a 01ff ffff 0006 3daa 0100 011e 0006 3db6 01ff ffff 0006 3dc6 01ff ffff 0006 3dd6 01ff ffff 0006 3de6 0100 0322
0274420 0006 3df8 0100 00fa 0006 3e0e 0100 0316 0006 3e20 01ff ffff 0006 3e36 01ff ffff 0006 3e3e 01ff ffff 0006 3e48 01ff ffff
0274500 0006 3e54 0100 0343 0006 3e6a 0100 0329 0006 3e78 01ff ffff 0006 3e88 01ff ffff 0006 3e9a 01ff ffff 0006 3eac 01ff ffff
0274560 0006 3ec0 01ff ffff 0006 3ed2 01ff ffff 0006 3ee2 01ff ffff 0006 3ef2 01ff ffff 0006 3f02 01ff ffff 0006 3f12 0100 0324
0274640 0006 3f2a 0100 0325 0006 3f3a 0100 0327 0006 3f4a 01ff ffff 0006 3f58 01ff ffff 0006 3f62 01ff ffff 0006 3f72 0100 02f2
0274720 0006 3f86 01ff ffff 0006 3f96 0100 02d2 0006 3fa4 01ff ffff 0006 3fb4 01ff ffff 0006 3fc4 0100 01bc 0006 3fd0 01ff ffff
0275000 0006 3fe0 0100 02b5 0006 3fee 0100 031e 0006 4004 0100 035c 0006 4014 01ff ffff 0006 4024 01ff ffff 0006 4034 01ff ffff
0275060 0006 404a 01ff ffff 0006 405a 0100 0339 0006 406c 01ff ffff 0006 4078 0100 029b 0006 4086 0100 0321 0006 4094 0100 0337
0275140 0006 40a8 0100 0333 0006 40c0 01ff ffff 0006 40cc 01ff ffff 0006 40d8 01ff ffff 0006 40e4 01ff ffff 0006 40f0 01ff ffff
0275220 0006 40fc 01ff ffff 0006 4108 01ff ffff 0006 4114 0100 0308 0006 4126 01ff ffff 0006 4130 01ff ffff 0006 4140 01ff ffff
0275300 0006 4158 0100 0376 0006 4172 01ff ffff 0006 417e 01ff ffff 0006 4182 0100 012a 0006 418c 0100 017f 0006 4194 01ff ffff
0275360 0006 41a6 0100 01ca 0006 41b0 0100 01cf 0006 41c6 01ff ffff 0006 41d0 01ff ffff 0006 41d8 01ff ffff 0006 41e2 01ff ffff
0275440 0006 41ea 01ff ffff 0006 41fa 0100 0371 0006 4200 01ff ffff 0006 420e 01ff ffff 0006 4220 0100 0367 0006 423a 01ff ffff
0275520 0006 4246 01ff ffff 0006 424c 01ff ffff 0006 4258 0100 0222 0006 426a 01ff ffff 0006 427a 0100 018f 0006 4284 01ff ffff
0275600 0006 4292 01ff ffff 0006 42a2 0100 0326 0006 42b2 01ff ffff 0006 42ba 01ff ffff 0006 42ce 01ff ffff 0006 42e0 0100 0318
0275660 0006 42e6 01ff ffff 0006 42ee 01ff ffff 0006 42f6 01ff ffff 0006 42fe 0100 0375 0006 4308 0100 02c8 0006 4312 01ff ffff
0275740 0006 431c 01ff ffff 0006 4332 01ff ffff 0006 433a 01ff ffff 0006 4350 01ff ffff 0006 435e 01ff ffff 0006 4368 0100 01b9
0276020 0006 43a8 01ff ffff 0006 43d8 0100 03b5 0006 4416 0100 03b7 0006 4450 0100 03b8 0006 4488 01ff ffff 0006 4492 01ff ffff
```

```
0276100  0006 449c 01ff ffff 0006 44a4 01ff ffff 0006 44ba 0100 0001 0006 44d0 01ff ffff 0006 44e2 0100 03be 0006 4500 01ff ffff
0276160  0006 450a 01ff ffff 0006 4520 0100 0105 0006 4532 01ff ffff 0006 453e 01ff ffff 0006 4546 01ff ffff 0006 4550 01ff ffff
0276240  0006 455e 01ff ffff 0006 4566 01ff ffff 0006 4576 0100 03a5 0006 457e 0100 00ed 0006 4586 01ff ffff 0006 4598 01ff ffff
0276320  0006 459e 01ff ffff 0006 45c8 0100 030e 0006 45d4 01ff ffff 0006 45de 01ff ffff 0006 45e8 0100 037c 0006 45f0 01ff ffff
0276400  0006 45f4 0100 0334 0006 45fc 01ff ffff 0006 4608 01ff ffff 0006 4618 0100 036e 0006 465a 0100 03c2 0006 4672 01ff ffff
0276460  0006 467e 0100 03a3 0006 469e 0100 021a 0006 46ce 01ff ffff 0006 470e 01ff ffff 0006 472c 0100 02fa 0006 4744 01ff ffff
0276540  0006 4760 01ff ffff 0006 4792 01ff ffff 0006 47a4 01ff ffff 0006 47b6 01ff ffff 0006 47bc 01ff ffff 0006 47ce 01ff ffff
0276620  0006 47d4 0100 02e3 0006 47da 0100 0390 0006 47e2 0100 020a 0006 47f0 01ff ffff 0006 4802 01ff ffff 0006 4812 0100 01af
0276700  0006 481a 0100 0207 0006 482c 01ff ffff 0006 4840 01ff ffff 0006 4848 01ff ffff 0006 4876 01ff ffff 0006 487e 01ff ffff
0276760  0006 4889 01ff ffff 0006 48b0 0100 0380 0006 48c2 01ff ffff 0006 48ca 0100 03aa 0006 48d2 0100 0212 0006 48dc 0100 01cb
0277040  0006 48e6 01ff ffff 0006 48f0 01ff ffff 0006 48fc 01ff ffff 0006 4908 0100 0228 0006 4918 01ff ffff 0006 492c 01ff ffff
0277120  0006 4934 01ff ffff 0006 4940 01ff ffff 0006 494a 01ff ffff 0006 4956 01ff ffff 0006 496e 01ff ffff 0006 497a 01ff ffff
0277200  0006 4982 0100 01df 0006 498c 0100 0237 0006 499c 01ff ffff 0006 49ae 0100 0365 0006 49c0 01ff ffff 0006 49d0 01ff ffff
0277260  0006 49de 01ff ffff 0006 49f0 01ff ffff 0006 49fe 01ff ffff 0006 4a10 0100 0336 0006 4a24 01ff ffff 0006 4a36 01ff ffff
0277340  0006 4a3c 0100 019c 0006 4a40 0100 013d 0006 4a48 0100 00f1 0006 4a54 0100 02d6 0006 4a68 01ff ffff 0006 4a70 01ff ffff
0277420  0006 4a78 01ff ffff 0006 4a86 0100 011a 0006 4a94 01ff ffff 0006 4aa6 01ff ffff 0006 4ab0 01ff ffff 0006 4abc 01ff ffff
0277500  0006 4ac4 01ff ffff 0006 4ad0 01ff ffff 0006 4ae0 01ff ffff 0006 4aea 0100 03c7 0006 4af4 0100 034e 0006 4b0a 01ff ffff
0277560  0006 4b1a 01ff ffff 0006 4b22 01ff ffff 0006 4b2c 0100 0378 0006 4b32 01ff ffff 0006 4b42 0100 035a 0006 4b4c 01ff ffff
0277640  0006 4b5c 01ff ffff 0006 4b6a 01ff ffff 0006 4b7a 0100 03c3 0006 4b8a 01ff ffff 0006 4b92 01ff ffff 0006 4ba4 01ff ffff
0277720  0006 4bb6 01ff ffff 0006 4bc6 0100 0181 0006 4bd0 01ff ffff 0006 4bd8 01ff ffff 0006 4be0 0100 0391 0006 4bf2 01ff ffff
0300000  0006 4bfe 01ff ffff 0006 4c20 0100 02d5 0006 4c28 01ff ffff 0006 4c38 01ff ffff 0006 4c46 01ff ffff 0006 4c5c 01ff ffff
0300060  0006 4c68 0100 0151 0006 4c7e 01ff ffff 0006 4c8a 01ff ffff 0006 4c8e 0100 0149 0006 4c96 0100 03d6 0006 4ca4 01ff ffff
0300140  0006 4cc6 01ff ffff 0006 4ce4 0100 015a 0006 4d0c 01ff ffff 0006 4d24 01ff ffff 0006 4d48 0100 0161 0006 4d52 01ff ffff
0300220  0006 4d5a 01ff ffff 0006 4d64 01ff ffff 0006 4d6e 0100 03ab 0006 4d76 0100 040a 0006 4d88 0100 0186 0006 4d9c 01ff ffff
0300300  0006 4daa 0100 02ca 0006 4db2 0100 0328 0006 4dc4 01ff ffff 0006 4ddc 0100 0287 0006 4dee 01ff ffff 0006 4df8 01ff ffff
0300360  0006 4e00 0100 0432 0006 4e12 0100 0147 0006 4e1a 01ff ffff 0006 4e20 0100 0350 0006 4e30 01ff ffff 0006 4e6c 01ff ffff
0300440  0006 4e74 01ff ffff 0006 4e7e 01ff ffff 0006 4e8a 0100 042b 0006 4e94 01ff ffff 0006 4ea4 0100 042e 0006 4ebc 01ff ffff
0300520  0006 4ece 01ff ffff 0006 4ed8 0100 01d5 0006 4ee2 0100 00dc 0006 4eee 01ff ffff 0006 4ef6 01ff ffff 0006 4efe 01ff ffff
0300600  0006 4f08 01ff ffff 0006 4f0e 0100 037a 0006 4f14 01ff ffff 0006 4f46 01ff ffff 0006 4f8a 01ff ffff 0006 4f9c 0100 03b0
0300660  0006 4fb2 01ff ffff 0006 4fb8 01ff ffff 0006 4fc8 01ff ffff 0006 4fda 01ff ffff 0006 4fe6 0100 0452 0006 4ff8 01ff ffff
0300740  0006 5004 01ff ffff 0006 500e 01ff ffff 0006 5018 01ff ffff 0006 5022 01ff ffff 0006 5032 01ff ffff 0006 5038 0100 035e
0301020  0006 5040 01ff ffff 0006 5056 0100 039c 0006 506e 0100 0368 0006 507e 01ff ffff 0006 508a 01ff ffff 0006 509a 01ff ffff
0301100  0006 50a4 0100 0426 0006 50b2 01ff ffff 0006 50ca 0100 03f7 0006 50d4 01ff ffff 0006 50de 0100 00fc 0006 50ee 0100 01a5
0301160  0006 50f8 01ff ffff 0006 5110 01ff ffff 0006 5118 01ff ffff 0006 5120 0100 01ba 0006 5136 01ff ffff 0006 5140 0100 02ec
0301240  0006 5148 0100 03ca 0006 5150 01ff ffff 0006 515a 0100 0403 0006 5162 0100 0214 0006 516a 01ff ffff 0006 5176 01ff ffff
0301320  0006 517a 01ff ffff 0006 5180 0100 0379 0006 5196 0100 03fc 0006 51a8 01ff ffff 0006 51c6 0100 03b9 0006 51de 01ff ffff
0301400  0006 51f2 0100 0492 0006 520c 01ff ffff 0006 5218 0100 0216 0006 5228 0100 0428 0006 523a 0100 0219 0006 5240 0100 042a
0301460  0006 5250 01ff ffff 0006 5272 01ff ffff 0006 527c 01ff ffff 0006 528e 01ff ffff 0006 52a0 01ff ffff 0006 52aa 01ff ffff
0301540  0006 52b2 0100 0333 0006 52c4 0100 032f 0006 52da 0100 03f3 0006 52ee 01ff ffff 0006 52fc 01ff ffff 0006 5308 0100 00f3
0301620  0006 531e 01ff ffff 0006 5324 0100 01dc 0006 532e 0100 03c6 0006 5340 01ff ffff 0006 534c 01ff ffff 0006 5360 0100 03bf
0301700  0006 5376 0100 03a7 0006 5384 0100 01f1 0006 53a8 01ff ffff 0006 53c4 0100 03db 0006 53e6 01ff ffff 0006 540c 01ff ffff
0301760  0006 544c 0100 0418 0006 5482 0100 0355 0006 54be 01ff ffff 0006 54fc 01ff ffff 0006 552e 0100 01d3 0006 5562 0100 04b5
0302040  0006 5586 0100 04b6 0006 55ac 0100 0440 0006 55b8 0100 0465 0006 55be 01ff ffff 0006 5602 0100 04b8 0006 562c 01ff ffff
0302120  0006 5654 01ff ffff 0006 5678 0100 0301 0006 568a 0100 041d 0006 569e 01ff ffff 0006 56a6 01ff ffff 0006 56b0 0100 04a0
0302200  0006 56c2 01ff ffff 0006 56ca 01ff ffff 0006 56d6 0100 03fd 0006 56de 0100 01c2 0006 56ea 01ff ffff 0006 5702 01ff ffff
0302260  0006 5708 0100 02c2 0006 5712 0100 02d0 0006 5718 0100 04c4 0006 5726 01ff ffff 0006 572e 01ff ffff 0006 5738 01ff ffff
0302340  0006 574c 0100 0354 0006 575a 0100 04b3 0006 576a 01ff ffff 0006 5772 01ff ffff 0006 577a 01ff ffff 0006 5794 01ff ffff
0302420  0006 57a0 01ff ffff 0006 57ac 01ff ffff 0006 57b6 01ff ffff 0006 57be 0100 0344 0006 57dc 01ff ffff 0006 57e8 0100 0305
0302500  0006 57fe 0100 02ad 0006 580c 01ff ffff 0006 5818 01ff ffff 0006 582a 0100 018c 0006 583c 0100 03f5 0006 5852 0100 0449
0302560  0006 586c 0100 01e8 0006 5874 01ff ffff 0006 5882 0100 03da 0006 5888 01ff ffff 0006 5890 01ff ffff 0006 5898 0100 021e
0302640  0006 58a0 0100 010f 0006 58a4 01ff ffff 0006 58ae 0100 036c 0006 58c0 01ff ffff 0006 58ca 01ff ffff 0006 58d4 0100 049f
0302720  0006 58dc 01ff ffff 0006 58e6 01ff ffff 0006 58fa 0100 04d9 0006 5910 01ff ffff 0006 591c 01ff ffff 0006 5928 0100 0413
0303000  0006 5932 01ff ffff 0006 5968 01ff ffff 0006 5970 01ff ffff 0006 597c 0100 01f4 0006 5986 01ff ffff 0006 5992 0100 04f0
0303060  0006 59a4 01ff ffff 0006 59e2 0100 0499 0006 5a24 0100 0309 0006 5a54 01ff ffff 0006 5a8c 0100 049b 0006 5a96 01ff ffff
0303140  0006 5a9e 01ff ffff 0006 5aaa 0100 0383 0006 5ab0 01ff ffff 0006 5ab8 0100 04ff 0006 5ac4 01ff ffff 0006 5ace 01ff ffff
```

```
0303220 0006 5adc 0100 04bb 0006 5afe 0100 0505 0006 5b22 0100 0507 0006 5b4a 0100 02bb 0006 5b58 01ff ffff 0006 5b6e 01ff ffff
0303300 0006 5b8c 01ff ffff 0006 5bc8 0100 050c 0006 5c00 0100 050d 0006 5c3c 01ff ffff 0006 5c8e 01ff ffff 0006 5caa 0100 0159
0303360 0006 5cb6 01ff ffff 0006 5cca 01ff ffff 0006 5cd6 0100 03ed 0006 5ce0 01ff ffff 0006 5cf0 0100 021f 0006 5d02 0100 03de
0303440 0006 5d16 01ff ffff 0006 5d26 01ff ffff 0006 5d3a 0100 0310 0006 5d4e 0100 01db 0006 5d60 0100 038a 0006 5d72 01ff ffff
0303520 0006 5d84 0100 01a1 0006 5d96 01ff ffff 0006 5da8 01ff ffff 0006 5db8 01ff ffff 0006 5dce 01ff ffff 0006 5de0 0100 01a2
0303600 0006 5dee 01ff ffff 0006 5df6 01ff ffff 0006 5e20 01ff ffff 0006 5e34 01ff ffff 0006 5e3c 01ff ffff 0006 5e4e 0100 0303
0303660 0006 5e54 01ff ffff 0006 5e62 01ff ffff 0006 5e70 01ff ffff 0006 5e7c 0100 0236 0006 5e86 0100 04a9 0006 5e98 01ff ffff
0303740 0006 5ea0 0100 047c 0006 5ea6 01ff ffff 0006 5eac 01ff ffff 0006 5ecc 01ff ffff 0006 5ee4 0100 03dd 0006 5f06 01ff ffff
0304020 0006 5f14 0100 0370 0006 5f24 01ff ffff 0006 5f36 0100 0511 0006 5f40 0100 044f 0006 5f50 01ff ffff 0006 5f58 0100 052b
0304100 0006 5f60 01ff ffff 0006 5f78 01ff ffff 0006 5f80 01ff ffff 0006 5f8c 0100 0470 0006 5f96 0100 01a8 0006 5fa0 01ff ffff
0304160 0006 5fa8 01ff ffff 0006 5fb2 01ff ffff 0006 5fc4 0100 04c3 0006 5fcc 01ff ffff 0006 5fd8 01ff ffff 0006 5fde 0100 03bd
0304240 0006 5fe8 01ff ffff 0006 5fee 01ff ffff 0006 5ffc 01ff ffff 0006 6006 01ff ffff 0006 6016 01ff ffff 0006 6024 01ff ffff
0304320 0006 602e 01ff ffff 0006 6038 01ff ffff 0006 6046 01ff ffff 0006 604c 0100 04cb 0006 6052 01ff ffff 0006 605c 01ff ffff
0304400 0006 6062 0100 015b 0006 6068 0100 0174 0006 60ac 01ff ffff 0006 60b4 01ff ffff 0006 60be 0100 0463 0006 60c6 01ff ffff
0304460 0006 60d0 01ff ffff 0006 60d6 0100 012d 0006 60e2 01ff ffff 0006 60ea 01ff ffff 0006 60fe 01ff ffff 0006 610a 0100 0356
0304540 0006 6118 01ff ffff 0006 6124 01ff ffff 0006 6136 0100 0188 0006 613e 01ff ffff 0006 6148 01ff ffff 0006 6150 01ff ffff
0304620 0006 615a 0100 0215 0006 6162 0100 017d 0006 616e 0100 04aa 0006 6179 01ff ffff 0006 6186 01ff ffff 0006 6196 01ff ffff
0304700 0006 619e 0100 051e 0006 61a6 01ff ffff 0006 61b0 01ff ffff 0006 61c2 0100 04b1 0006 61ce 01ff ffff 0006 61de 01ff ffff
0304760 0006 61e6 01ff ffff 0006 61f2 0100 053f 0006 61f8 0100 01b7 0006 6204 0100 0485 0006 621a 0100 0129 0006 6240 0100 0191
0305040 0006 624a 0100 03fb 0006 6256 01ff ffff 0006 625e 0100 0113 0006 6272 01ff ffff 0006 6286 01ff ffff 0006 629c 0100 01f5
0305120 0006 62a6 01ff ffff 0006 62b4 01ff ffff 0006 62c2 01ff ffff 0006 62d8 01ff ffff 0006 62e2 0100 02f3 0006 62f0 0100 0521
0305200 0006 62fe 0100 0396 0006 630c 0100 02be 0006 631e 0100 0358 0006 6332 0100 0434 0006 633c 0100 04b7 0006 6342 0100 01a6
0305260 0006 635e 0100 0476 0006 6374 0100 01ea 0006 6390 01ff ffff 0006 63a6 0100 0574 0006 63be 01ff ffff 0006 63d4 0100 0401
0305340 0006 63e8 01ff ffff 0006 6400 0100 038b 0006 6412 01ff ffff 0006 6422 01ff ffff 0006 6432 0100 0436 0006 6444 01ff ffff
0305420 0006 644c 01ff ffff 0006 6456 0100 04cf 0006 646a 01ff ffff 0006 646e 01ff ffff 0006 6476 0100 057a 0006 647e 01ff ffff
0305500 0006 6488 01ff ffff 0006 649c 0100 0351 0006 64ac 0100 0361 0006 64be 01ff ffff 0006 64d2 0100 0402 0006 64e2 0100 0407
0305560 0006 64ee 01ff ffff 0006 64f8 0100 0102 0006 6504 0100 0395 0006 650e 0100 0556 0006 6516 0100 046e 0006 652a 0100 035f
0305640 0006 653a 01ff ffff 0006 6546 0100 0474 0006 6550 01ff ffff 0006 6560 01ff ffff 0006 656a 0100 04db 0006 6588 01ff ffff
0305720 0006 659c 01ff ffff 0006 65a6 0100 0369 0006 65b8 01ff ffff 0006 65c6 01ff ffff 0006 65da 01ff ffff 0006 65ec 01ff ffff
0306000 0006 65f6 0100 032c 0006 65fe 01ff ffff 0006 6608 0100 0597 0006 661c 01ff ffff 0006 6656 0100 05a5 0006 665e 0100 053d
0306060 0006 6666 01ff ffff 0006 6672 01ff ffff 0006 6682 0100 051b 0006 6690 01ff ffff 0006 669a 0100 044a 0006 66a8 01ff ffff
0306140 0006 66c4 01ff ffff 0006 66ca 01ff ffff 0006 66d4 0100 0304 0006 66dc 01ff ffff 0006 66e4 0100 0518 0006 66f6 01ff ffff
0306220 0006 670a 01ff ffff 0006 6718 0100 05a1 0006 6728 01ff ffff 0006 6738 0100 0366 0006 6748 0100 047f 0006 6754 01ff ffff
0306300 0006 6764 01ff ffff 0006 676e 0100 05c5 0006 6786 01ff ffff 0006 6796 01ff ffff 0006 67a2 0100 0477 0006 67ba 0100 0478
0306360 0006 67ca 01ff ffff 0006 67d6 01ff ffff 0006 67e0 0100 015d 0006 67ee 0100 056c 0006 67f6 01ff ffff 0006 6802 0100 05b4
0306440 0006 680a 0100 0579 0006 6812 0100 04e3 0006 681e 0100 0565 0006 682c 0100 05b7 0006 6836 01ff ffff 0006 6846 01ff ffff
0306520 0006 6854 01ff ffff 0006 685c 01ff ffff 0006 6868 01ff ffff 0006 6870 0100 018d 0006 6880 01ff ffff 0006 6888 0100 0177
0306600 0006 6890 0100 0300 0006 689a 01ff ffff 0006 68a8 01ff ffff 0006 68bc 01ff ffff 0006 68c4 01ff ffff 0006 68ce 01ff ffff
0306660 0006 68d4 01ff ffff 0006 68e0 0100 02b4 0006 68f0 01ff ffff 0006 68fc 0100 042c 0006 6910 0100 042d 0006 6924 0100 0538
0306740 0006 692c 0100 0420 0006 6936 01ff ffff 0006 6944 01ff ffff 0006 694e 01ff ffff 0006 6956 01ff ffff 0006 6964 0100 0496
0307020 0006 696e 01ff ffff 0006 697c 0100 013a 0006 698e 01ff ffff 0006 69be 0100 02b1 0006 69e8 0100 03e3 0006 6a22 01ff ffff
0307100 0006 6a2c 01ff ffff 0006 6a42 0100 0537 0006 6a50 0100 054f 0006 6a5e 01ff ffff 0006 6a6e 01ff ffff 0006 6a84 0100 05dc
0307160 0006 6aa2 01ff ffff 0006 6aa8 01ff ffff 0006 6ab2 01ff ffff 0006 6ada 0100 04f8 0006 6ae0 01ff ffff 0006 6aea 01ff ffff
0307240 0006 6af8 0100 04a6 0006 6afe 0100 02df 0006 6b0a 0100 020d 0006 6b1a 0100 0601 0006 6b32 01ff ffff 0006 6b3a 01ff ffff
0307320 0006 6b44 0100 05bf 0006 6b4c 01ff ffff 0006 6b54 01ff ffff 0006 6b76 0100 01ce 0006 6b88 01ff ffff 0006 6b9c 01ff ffff
0307400 0006 6ba8 01ff ffff 0006 6bb6 0100 058f 0006 6bd0 01ff ffff 0006 6bd8 01ff ffff 0006 6be0 01ff ffff 0006 6bf4 0100 0229
0307460 0006 6c22 0100 0619 0006 6c42 01ff ffff 0006 6c4a 0100 0617 0006 6c52 0100 03f0 0006 6c82 0100 0532 0006 6ca2 01ff ffff
0307540 0006 6caa 0100 0588 0006 6cb0 01ff ffff 0006 6cb8 0100 00e0 0006 6cc0 0100 01b4 0006 6cd2 0100 02ee 0006 6cde 0100 03d8
0307620 0006 6cf8 0100 04a2 0006 6d10 01ff ffff 0006 6d3c 0100 0627 0006 6d6e 0100 0500 0006 6d96 0100 016a 0006 6da2 01ff ffff
0307700 0006 6daa 0100 051e 0006 6dd8 01ff ffff 0006 6de6 01ff ffff 0006 6df2 0100 05d6 0006 6dfc 01ff ffff 0006 6e06 0100 016e
0307760 0006 6e0e 0100 02eb 0006 6e18 01ff ffff 0006 6e22 0100 0307 0006 6e2c 01ff ffff 0006 6e3a 01ff ffff 0006 6e48 01ff ffff
0310040 0006 6e54 0100 0578 0006 6e5c 0100 021d 0006 6e68 0100 04eb 0006 6e74 01ff ffff 0006 6e80 0100 049a 0006 6eae 01ff ffff
0310120 0006 6ece 01ff ffff 0006 6f02 0100 0163 0006 6f26 0100 01d2 0006 6f48 0100 057c 0006 6f50 0100 0636 0006 6f5c 01ff ffff
0310200 0006 6f68 01ff ffff 0006 6f70 0100 00e2 0006 6f7e 01ff ffff 0006 6f86 0100 05b0 0006 6f90 0100 01ae 0006 6fac 0100 0526
0310260 0006 6fc2 0100 03d5 0006 6fcc 01ff ffff 0006 6fd6 01ff ffff 0006 6fde 01ff ffff 0006 7022 0100 0446 0006 7030 0100 04fd
```

| | | | | | | | | | | | | | | | | |
|---|---|---|---|---|---|---|---|---|---|---|---|---|---|---|---|---|
| 0310340 | 0006 | 7070 | 0100 | 0545 | 0006 | 7078 | 01ff | ffff | 0006 | 7086 | 0100 | 0481 | 0006 | 709c | 0100 | 05ea |
| 0310420 | 0006 | 70c6 | 0100 | 050e | 0006 | 70d4 | 01ff | ffff | 0006 | 70e4 | 0100 | 0347 | 0006 | 70f2 | 01ff | ffff |
| 0310500 | 0006 | 7104 | 0100 | 02d7 | 0006 | 7110 | 01ff | ffff | 0006 | 7136 | 01ff | ffff | 0006 | 7154 | 0100 | 061d |
| 0310560 | 0006 | 71a2 | 01ff | ffff | 0006 | 71ac | 0100 | 05e9 | 0006 | 71b2 | 0100 | 0553 | 0006 | 71be | 01ff | ffff |
| 0310640 | 0006 | 71e0 | 0100 | 0512 | 0006 | 71ee | 01ff | ffff | 0006 | 71f8 | 01ff | ffff | 0006 | 7200 | 01ff | ffff |
| 0310720 | 0006 | 7248 | 01ff | ffff | 0006 | 7278 | 01ff | ffff | 0006 | 7280 | 01ff | ffff | 0006 | 7288 | 01ff | ffff |
| 0311000 | 0006 | 72ec | 01ff | ffff | 0006 | 72f6 | 0100 | 063e | 0006 | 7316 | 0100 | 055f | 0006 | 732c | 01ff | ffff |
| 0311060 | 0006 | 733e | 0100 | 0612 | 0006 | 7344 | 01ff | ffff | 0006 | 734a | 01ff | ffff | 0006 | 7350 | 01ff | ffff |
| 0311140 | 0006 | 735e | 0100 | 03cf | 0006 | 7362 | 0100 | 0676 | 0006 | 7368 | 0100 | 063a | 0006 | 7370 | 0100 | 0224 |
| 0311220 | 0006 | 7382 | 0100 | 03e6 | 0006 | 7398 | 0100 | 0109 | 0006 | 73d4 | 0100 | 0687 | 0006 | 7414 | 0100 | 04cc |
| 0311300 | 0006 | 7482 | 01ff | ffff | 0006 | 74b2 | 01ff | ffff | 0006 | 74d2 | 0100 | 04d3 | 0006 | 74ec | 0100 | 0668 |
| 0311360 | 0006 | 7572 | 0100 | 0691 | 0006 | 75c8 | 01ff | ffff | 0006 | 75d4 | 01ff | ffff | 0006 | 75f6 | 0100 | 0406 |
| 0311440 | 0006 | 7678 | 01ff | ffff | 0006 | 76dc | 0100 | 0455 | 0006 | 772c | 01ff | ffff | 0006 | 774c | 0100 | 052a |
| 0311520 | 0006 | 782a | 0100 | 04bf | 0006 | 786a | 0100 | 0696 | 0006 | 78ca | 01ff | ffff | 0006 | 78f6 | 01ff | ffff |
| 0311600 | 0006 | 7938 | 01ff | ffff | 0006 | 795c | 01ff | ffff | 0006 | 798e | 01ff | ffff | 0006 | 79b0 | 01ff | ffff |
| 0311660 | 0006 | 79e6 | 0100 | 013e | 0006 | 7a20 | 0100 | 069f | 0006 | 7a5e | 01ff | ffff | 0006 | 7a94 | 0100 | 0139 |
| 0311740 | 0006 | 7b0a | 01ff | ffff | 0006 | 7b2a | 01ff | ffff | 0006 | 7b42 | 01ff | ffff | 0006 | 7b6a | 01ff | ffff |
| 0312020 | 0006 | 7bde | 0100 | 04a7 | 0006 | 7c06 | 0100 | 04b9 | 0006 | 7c24 | 0100 | 0313 | 0006 | 7c44 | 01ff | ffff |
| 0312100 | 0006 | 7cc8 | 01ff | ffff | 0006 | 7ce2 | 01ff | ffff | 0006 | 7cfe | 0100 | 064f | 0006 | 7d26 | 0100 | 020e |
| 0312160 | 0006 | 7d82 | 0100 | 041c | 0006 | 7da4 | 01ff | ffff | 0006 | 7dc8 | 01ff | ffff | 0006 | 7df6 | 0100 | 046c |
| 0312240 | 0006 | 7e6a | 0100 | 01c7 | 0006 | 7e9c | 0100 | 058d | 0006 | 7ed4 | 0100 | 0498 | 0006 | 7f0c | 01ff | ffff |
| 0312320 | 0006 | 7f92 | 0100 | 05a2 | 0006 | 7fb4 | 0100 | 0456 | 0006 | 7fda | 0100 | 06cf | 0006 | 8002 | 0100 | 06d0 |
| 0312400 | 0006 | 805e | 0100 | 06b6 | 0006 | 8082 | 01ff | ffff | 0006 | 80b4 | 01ff | ffff | 0006 | 8106 | 01ff | ffff |
| 0312460 | 0006 | 817e | 0100 | 02e7 | 0006 | 81a2 | 0100 | 0200 | 0006 | 81cc | 0100 | 038d | 0006 | 81e4 | 01ff | ffff |
| 0312540 | 0006 | 8244 | 0100 | 042f | 0006 | 8266 | 0100 | 06cd | 0006 | 8290 | 01ff | ffff | 0006 | 82cc | 0100 | 05d2 |
| 0312620 | 0006 | 8328 | 0100 | 04ab | 0006 | 836a | 0100 | 054e | 0006 | 839c | 0100 | 064e | 0006 | 83e0 | 01ff | ffff |
| 0312700 | 000a | a05e | 0100 | 0548 | 000a | a066 | 0100 | 0117 | 000a | a072 | 01ff | ffff | 000a | a426 | 01ff | ffff |
| 0312760 | 000a | a61e | 0100 | 0684 | 000a | a62a | 0100 | 0127 | 000a | a632 | 01ff | ffff | 000a | a646 | 01ff | ffff |
| 0313040 | 000a | a75e | 0100 | 0592 | 000a | a7c6 | 0100 | 0122 | 000a | a7d2 | 01ff | ffff | 000a | aada | 01ff | ffff |
| 0313120 | 000a | af86 | 01ff | ffff | 000a | afc2 | 01ff | ffff | 000a | d06e | 01ff | ffff | 000a | d126 | 01ff | ffff |
| 0313200 | 000a | f336 | 0100 | 0544 | 000a | f36a | 0100 | 03eb | 000b | 13a6 | 01ff | ffff | 000b | 13d2 | 0100 | 0589 |
| 0313260 | 000b | 169e | 01ff | ffff | 000b | 16aa | 01ff | ffff | 000b | 16b6 | 01ff | ffff | 000b | 16c6 | 01ff | ffff |
| 0313340 | 000b | 186e | 01ff | ffff | 000b | 192a | 01ff | ffff | 000b | 19d2 | 01ff | ffff | 000b | 1aae | 0100 | 0430 |
| 0313420 | 000b | 1c5a | 01ff | ffff | 000b | 1d2e | 0100 | 0703 | 000b | 1d22 | 0100 | 0398 | 000b | 1ca2 | 01ff | ffff |
| 0313500 | 000a | d2e6 | 0100 | 0719 | 000a | d32a | 01ff | ffff | 000b | 1316 | 01ff | ffff | 000b | 1b8e | 01ff | ffff |
| 0313560 | 000b | 1cfe | 01ff | ffff | 000b | 1cee | 0100 | 0568 | 000a | f2d6 | 01ff | ffff | 000b | 18e6 | 01ff | ffff |
| 0313640 | 000b | 1d46 | 0100 | 071f | 000b | 1d5e | 01ff | ffff | 000a | f2c2 | 0100 | 05af | 000b | 1cda | 01ff | ffff |
| 0313720 | 000b | 1d96 | 0100 | 03e0 | 000b | 1da2 | 01ff | ffff | 000b | 1a36 | 0100 | 068e | 000b | 18d6 | 0100 | 04e8 |
| 0314000 | 000b | 1dce | 01ff | ffff | 000b | 1de2 | 01ff | ffff | 000b | 1df6 | 0100 | 0608 | 000b | 1752 | 01ff | ffff |
| 0314060 | 000a | e546 | 01ff | ffff | 000a | e57a | 01ff | ffff | 000a | e6e6 | 0100 | 073a | 000a | e71e | 0100 | 073b |
| 0314140 | 000b | 3f26 | 0100 | 0364 | 000b | 3f36 | 0100 | 05d8 | 000b | 3f46 | 0100 | 04d4 | 000b | 3f5e | 01ff | ffff |
| 0314220 | 000b | 4126 | 0100 | 0631 | 000b | 4686 | 0100 | 05ba | 000b | 4582 | 0100 | 0728 | 000b | 1f3e | 0100 | 0515 |
| 0314300 | 000b | 4462 | 0100 | 034c | 000b | 467a | 01ff | ffff | 000b | 466e | 01ff | ffff | 000b | 42ce | 0100 | 04c8 |
| 0314360 | 000b | 4492 | 0100 | 0575 | 000a | e812 | 0100 | 03cc | 000b | 4656 | 01ff | ffff | 000b | 67f2 | 0100 | 04b2 |
| 0314440 | 000b | 222a | 0100 | 0756 | 000b | 2262 | 0100 | 0757 | 000b | 464a | 0100 | 049d | 000b | 4432 | 01ff | ffff |
| 0314520 | 000b | 4306 | 0100 | 0157 | 000b | 68ba | 0100 | 037b | 000b | 68ea | 0100 | 0519 | 000b | 691e | 0100 | 075f |
| 0314600 | 000b | 8a36 | 01ff | ffff | 000b | 89d2 | 01ff | ffff | 000b | ab7e | 0100 | 03b3 | 000b | ad4e | 01ff | ffff |
| 0314660 | 000b | aec2 | 0100 | 0769 | 000a | ee22 | 0100 | 01c1 | 000b | b04e | 01ff | ffff | 000b | b07e | 01ff | ffff |
| 0314740 | 000b | b162 | 0100 | 076a | 000b | b1b2 | 0100 | 05e7 | 000b | b1ca | 0100 | 0765 | 000b | b25a | 0100 | 0423 |
| 0315020 | 000b | b382 | 0100 | 076f | 000b | 2b5e | 0100 | 041a | 000b | 2b9a | 01ff | ffff | 000b | 2bde | 01ff | ffff |
| 0315100 | 000b | d3ea | 01ff | ffff | 000b | d3fe | 0100 | 013f | 000b | 2cba | 0100 | 0704 | 000b | d432 | 01ff | ffff |
| 0315160 | 000b | 8c2e | 01ff | ffff | 000b | 8c5e | 0100 | 0192 | 000b | 8c92 | 0100 | 0782 | 000b | 8cce | 0100 | 0783 |
| 0315240 | 000b | de7e | 0100 | 06f7 | 000b | b26a | 01ff | ffff | 000b | b1e2 | 01ff | ffff | 000b | b152 | 01ff | ffff |
| 0315320 | 000c | 02c2 | 0100 | 0785 | 000c | 039e | 0100 | 0405 | 000c | 0452 | 0100 | 063b | 000a | 265a | 0100 | 03f1 |
| 0315400 | 000c | 03f6 | 01ff | ffff | 000c | 0232 | 0100 | 06ec | 000b | ddf2 | 0100 | 05ed | 000b | de36 | 0100 | 02b2 |

| | | | | | | | | |
|---|---|---|---|---|---|---|---|---|
| 0310340 | 0006 | 70a8 | 01ff | ffff | 0006 | 70b6 | 0100 | 044e |
| 0310420 | 0006 | 70f6 | 0100 | 0560 | 0006 | 70fe | 0100 | 0182 |
| 0310500 | 0006 | 7170 | 01ff | ffff | 0006 | 7198 | 01ff | ffff |
| 0310560 | 0006 | 71c6 | 01ff | ffff | 0006 | 71d2 | 01ff | ffff |
| 0310640 | 0006 | 7208 | 01ff | ffff | 0006 | 7216 | 01ff | ffff |
| 0310720 | 0006 | 72b2 | 01ff | ffff | 0006 | 72da | 01ff | ffff |
| 0311000 | 0006 | 7332 | 0100 | 0389 | 0006 | 7338 | 0100 | 0663 |
| 0311060 | 0006 | 7354 | 0100 | 0388 | 0006 | 7358 | 01ff | ffff |
| 0311140 | 0006 | 7378 | 01ff | ffff | 0006 | 737e | 01ff | ffff |
| 0311220 | 0006 | 743c | 0100 | 0688 | 0006 | 746a | 0100 | 068a |
| 0311300 | 0006 | 7502 | 01ff | ffff | 0006 | 753c | 01ff | ffff |
| 0311360 | 0006 | 7604 | 01ff | ffff | 0006 | 7638 | 0100 | 0683 |
| 0311440 | 0006 | 77b0 | 01ff | ffff | 0006 | 77fe | 0100 | 0571 |
| 0311520 | 0006 | 7906 | 01ff | ffff | 0006 | 791e | 0100 | 0514 |
| 0311600 | 0006 | 79c0 | 01ff | ffff | 0006 | 79d8 | 01ff | ffff |
| 0311660 | 0006 | 7aae | 01ff | ffff | 0006 | 7ac8 | 01ff | ffff |
| 0311740 | 0006 | 7ba6 | 01ff | ffff | 0006 | 7bc4 | 01ff | ffff |
| 0312020 | 0006 | 7c6a | 01ff | ffff | 0006 | 7c96 | 01ff | ffff |
| 0312100 | 0006 | 7d40 | 0100 | 0573 | 0006 | 7d5e | 0100 | 06b9 |
| 0312160 | 0006 | 7e20 | 01ff | ffff | 0006 | 7e48 | 0100 | 0399 |
| 0312240 | 0006 | 7f34 | 0100 | 06ca | 0006 | 7f60 | 0100 | 06cc |
| 0312320 | 0006 | 8022 | 0100 | 03ac | 0006 | 8044 | 0100 | 06b8 |
| 0312400 | 0006 | 8132 | 0100 | 00ef | 0006 | 8158 | 0100 | 0488 |
| 0312460 | 0006 | 8204 | 01ff | ffff | 0006 | 8224 | 0100 | 051d |
| 0312540 | 0006 | 82f8 | 0100 | 0546 | 0006 | 8310 | 0100 | 06c2 |
| 0312620 | 0000 | 0000 | 0000 | 0000 | 0000 | 0000 | 0000 | 0000 |
| 0312700 | 000a | a442 | 0100 | 06ef | 000a | a4de | 0100 | 0381 |
| 0312760 | 000a | a652 | 01ff | ffff | 000a | a756 | 0100 | 05d0 |
| 0313040 | 000a | aaf2 | 01ff | ffff | 000a | ab4e | 01ff | ffff |
| 0313120 | 000a | d1a6 | 0100 | 0701 | 000a | d1ee | 01ff | ffff |
| 0313200 | 000b | 1492 | 0100 | 0706 | 000b | 143a | 0100 | 0707 |
| 0313260 | 000b | 17c2 | 0100 | 0550 | 000b | 17d6 | 0100 | 0221 |
| 0313340 | 000b | 1aba | 01ff | ffff | 000b | 1bd6 | 01ff | ffff |
| 0313420 | 000a | d266 | 01ff | ffff | 000a | d2a6 | 01ff | ffff |
| 0313500 | 000b | 198e | 01ff | ffff | 000b | 1d0a | 0100 | 02c0 |
| 0313560 | 000b | 1a66 | 0100 | 0689 | 000b | 1cce | 01ff | ffff |
| 0313640 | 000b | 1d76 | 0100 | 02f4 | 000b | 1d8a | 01ff | ffff |
| 0313720 | 000b | 1816 | 0100 | 0725 | 000b | 1dba | 0100 | 072b |
| 0314000 | 000a | e52e | 0100 | 049c | 000a | e53a | 01ff | ffff |
| 0314060 | 000b | 3f06 | 01ff | ffff | 000b | 3f16 | 0100 | 041f |
| 0314140 | 000a | e4d2 | 0100 | 0534 | 000a | e7b2 | 0100 | 0593 |
| 0314220 | 000b | 1f6e | 01ff | ffff | 000b | 4522 | 01ff | ffff |
| 0314300 | 000b | 669a | 0100 | 0745 | 000b | 4662 | 0100 | 03c1 |
| 0314360 | 000b | 21ca | 0100 | 0628 | 000b | 21fa | 0100 | 04ca |
| 0314440 | 000b | 463e | 0100 | 06d8 | 000b | 8922 | 0100 | 05e1 |
| 0314520 | 000b | 695a | 0100 | 0760 | 000b | 8ab6 | 0100 | 074c |
| 0314600 | 000b | ae96 | 01ff | ffff | 000b | aeaa | 0100 | 0768 |
| 0314660 | 000b | b09a | 01ff | ffff | 000b | b0b2 | 0100 | 0314 |
| 0314740 | 000b | b29a | 01ff | ffff | 000b | b2a6 | 0100 | 0770 |
| 0315020 | 000b | 2c16 | 0100 | 0778 | 000b | d3e2 | 0100 | 03ad |
| 0315100 | 000b | d446 | 01ff | ffff | 000b | b32e | 0100 | 05d5 |
| 0315160 | 000b | b17a | 0100 | 0766 | 000b | de8a | 01ff | ffff |
| 0315240 | 000b | de72 | 01ff | ffff | 000c | 013e | 0100 | 06d9 |
| 0315320 | 000c | 0476 | 0100 | 05b5 | 000c | 047e | 0100 | 074a |
| 0315400 | 000c | 0496 | 0100 | 05e2 | 000c | 0666 | 01ff | ffff |

```
0315460 000b de1e 01ff ffff 000c 06c6 01ff ffff 000c 071e 0100 05f5 000b de5a 0100 06c0 000b aede 01ff ffff 000b de06 01ff ffff
0315540 000b 45e6 01ff ffff 000c 08de 0100 0522 000c e522 0100 0490 000c 097e 01ff ffff 000c 098e 01ff ffff 000b d412 01ff ffff
0315620 000c 0522 0100 01b1 000c 0bba 0100 072e 000c 0bc2 01ff ffff 000c 0c2a 01ff ffff 000c 0c32 0100 01c0 000c 0c46 0100 07a9
0315700 000c 0c4e 0100 0302 000c 0c8e 0100 043e 000c 0cd6 0100 072f 000c 0d4a 0100 0448 000c 0d6e 01ff ffff 000c 0f6a 0100 0740
0315760 000c 11a6 0100 05fc 000c 126a 01ff ffff 000c 1412 01ff ffff 000b 63de 01ff ffff 000c 1476 0100 07a3 000c 1486 01ff ffff
0316040 000c 1496 0100 0146 000b 6482 0100 03f9 000c 1536 0100 0736 000c 14ee 0100 0176 000c 1566 0100 05f3 000c 15de 0100 03df
0316120 000c 1602 0100 066f 000c 20f6 0100 0411 000a f436 0100 071d 000c 20de 01ff ffff 000c 20ea 0100 0635 000a f28e 01ff ffff
0316200 000a f512 01ff ffff 000a f542 0100 0195 000a f572 0100 07c4 000a f5aa 0100 07c5 000a f5e6 0100 07ab 000a f616 0100 05e3
0316260 000a f646 0100 07c8 000a f67e 0100 07c9 000a f6ba 0100 012e 000a f6e6 01ff ffff 000a f716 0100 07cc 000a f74e 0100 07cd
0316340 000c 20d2 01ff ffff 000c 20c6 0100 072a 000c 20ba 01ff ffff 000c 20ae 0100 0634 000c 20a2 01ff ffff 000c 2096 01ff ffff
0316420 000c 208a 0100 0653 000c 137a 0100 0543 000c 13e6 0100 0340 000c 13c2 01ff ffff 000c 207e 0100 04d0 000c 2072 0100 0453
0316500 000c 2066 01ff ffff 000c 134a 0100 07c2 000c 12c6 01ff ffff 000c 205a 01ff ffff 000c 204e 0100 0698 000c 2042 0100 0288
0316560 000c 2036 01ff ffff 000c 202a 0100 0561 000c 201e 0100 0774 000c 1092 0100 04df 000c 2012 0100 0504 000c 2006 0100 0708
0316640 000c 1ffa 0100 0201 000c 44ea 0100 0767 000c 06d6 01ff ffff 000c 0eca 01ff ffff 000c 1fb2 01ff ffff 000c 1e62 0100 0180
0316720 000c 1e6e 0100 0744 000c 1e7a 0100 0742 000c 1e86 01ff ffff 000c 1e92 0100 04fb 000b dde6 0100 06af 000c 499a 01ff ffff
0317000 000c 894e 0100 05be 000c 1f22 0100 019b 000c 4962 0100 0497 000c 215a 01ff ffff 000c 1fbe 0100 0749 000c 1972 0100 0108
0317060 000c 8c26 01ff ffff 000c 0a2e 0100 03a9 000c 8c3a 0100 00de 000c 1fee 0100 06e8 000c 099e 0100 0220 000c 1e9e 01ff ffff
0317140 000c 096e 0100 0787 000c 8e56 0100 06ad 000a e646 01ff ffff 000a f14e 0100 02a8 000a f17e 0100 0802 000b 0166 0100 0803
0317220 000b de2a 0100 0904 000c af4a 01ff ffff 000c b056 0100 068b 000c b07e 0100 0808 000c b106 0100 057b 000c 1ec2 0100 0572
0317300 000c b14e 01ff ffff 000c b156 0100 0187 000c b186 0100 0717 000c b192 0100 06e5 000c b17e 0100 0346 000c b1da 01ff ffff
0317360 000c b20a 01ff ffff 000c b212 0100 051c 000c b26a 0100 05cf 000c b272 0100 0558 000c b29a 01ff ffff 000c b2a2 0100 0584
0317440 000c b2da 01ff ffff 000c b2e2 01ff ffff 000c b312 01ff ffff 000c b31e 01ff ffff 000c b34e 01ff ffff 000c b356 01ff ffff
0317520 000c b386 0100 079f 000c b1ca 01ff ffff 000c b3ae 01ff ffff 000c b3ba 01ff ffff 000c b3ea 01ff ffff 000c b3f6 0100 036d
0317600 000c b426 0100 0575 000c b432 01ff ffff 000c b462 0100 0530 000c b46e 0100 0660 000c b49a 01ff ffff 000c 1a96 0100 03d1
0317660 000c b4c2 01ff ffff 000c b4ca 01ff ffff 000c b4fa 0100 05ca 000c b506 01ff ffff 000c b532 0100 0226 000c b53a 01ff ffff
0317740 000c b56a 01ff ffff 000c b576 01ff ffff 000c b5a6 0100 02fb 000c b5b2 01ff ffff 000c b5e2 01ff ffff 000c b5ee 0100 0833
0320020 000c b61e 01ff ffff 000c b62a 01ff ffff 000c b65a 0100 06ed 000b de42 0100 0437 000c b682 0100 07a5 000c b68e 0100 07c3
0320100 000c b6c2 01ff ffff 000c b6ce 0100 0479 000c b6fe 01ff ffff 000c b70a 01ff ffff 000c b73a 0100 038e 000c b742 0100 0385
0320160 000c b772 0100 02f1 000c b77e 01ff ffff 000c b7b6 01ff ffff 000c b7c2 0100 0576 000c b7ee 01ff ffff 000c b7f6 01ff ffff
0320240 000c b82a 0100 0130 000c b836 0100 0664 000c b866 0100 0629 000c b86e 01ff ffff 000c b89a 01ff ffff 000c b8a2 0100 070b
0320320 000c b8d6 0100 0467 000c b8e2 0100 034d 000c b912 0100 06f1 000c b922 0100 05b9 000c b956 01ff ffff 000c b966 0100 01f2
0320400 000c b99e 0100 059b 000c b24a 0100 0353 000c b9c6 0100 0671 000c b9d2 0100 0155 000c ba12 0100 082a 000c ba22 0100 04bc
0320460 000c ba5e 0100 04ba 000c ba6a 01ff ffff 000c ba9a 01ff ffff 000c baaa 01ff ffff 000c baea 01ff ffff 000c bafa 0100 0506
0320540 000c bb32 01ff ffff 000c bb46 0100 0654 000c bb7e 0100 0290 000c bb92 0100 0861 000c bbca 0100 0680 000c bbda 01ff ffff
0320620 000c bc1a 0100 0862 000c bc2a 0100 0863 000c bc66 0100 083d 000b 0672 0100 0441 000c bc92 0100 066c 000c bca2 01ff ffff
0320700 000c bcda 01ff ffff 000c bcea 0100 0827 000c bd2a 0100 0647 000c bd36 01ff ffff 000c bd66 01ff ffff 000c bd76 0100 0854
0320760 000c bdae 01ff ffff 000c bdba 0100 0338 000c bdfe 0100 0101 000c be0e 0100 0110 000c be4e 01ff ffff 000c be5e 01ff ffff
0321040 000c be96 0100 0776 000c bea2 01ff ffff 000c beda 01ff ffff 000c bee6 01ff ffff 000c bf22 01ff ffff 000c bf2e 01ff ffff
0321120 000c bf66 01ff ffff 000c bf72 0100 03a0 000c bfb2 01ff ffff 000c bfc2 0100 0606 000c c002 01ff ffff 000c c00e 0100 07e2
0321200 000c c042 01ff ffff 000c c052 01ff ffff 000c c086 0100 06bd 000c c08e 01ff ffff 000c c0ce 01ff ffff 000c c0de 0100 085b
0321260 000c c112 0100 05c7 000c c11e 01ff ffff 000c c14a 01ff ffff 000c c15a 01ff ffff 000c c18a 0100 06c9 000c c196 01ff ffff
0321340 000c c1ca 0100 07b0 000c c1d6 0100 0821 000c c20a 0100 078f 000c c216 01ff ffff 000c c246 0100 036f 000c c252 01ff ffff
0321420 000c c286 0100 05f6 000c c292 01ff ffff 000c c2c6 0100 0800 000c c2d2 01ff ffff 000c c312 01ff ffff 000c c31e 01ff ffff
0321500 000c c356 01ff ffff 000c c35e 01ff ffff 000c c38a 0100 0630 000c c392 0100 015f 000c c3ca 0100 010d 000c c3d6 0100 0835
0321560 000c c412 0100 0342 000c c41e 01ff ffff 000c c45e 0100 014d 000c c466 01ff ffff 000c c49a 0100 00f5 000c c4a6 0100 0581
0321640 000c c4da 01ff ffff 000c c4e6 0100 0879 000c c51e 0100 0468 000c c52a 01ff ffff 000c c566 0100 04dd 000c c572 0100 0535
0321720 000c c5a2 0100 0211 000c c5ae 0100 0582 000c c5e6 01ff ffff 000c c5ee 0100 087e 000c c61e 0100 06f2 000c c62a 0100 02cd
0322000 000c c656 0100 02c1 000c c65e 0100 07da 000c c69a 0100 083f 000c c6a6 0100 0415 000c c6d6 0100 0693 000c c6e2 01ff ffff
0322060 000c c716 01ff ffff 000c c722 0100 08a0 000c c762 01ff ffff 000c c76e 01ff ffff 000c c7a6 0100 07fc 000c c7b2 0100 06c5
0322140 000c c7ea 0100 0696 000c c7f6 01ff ffff 000c c832 01ff ffff 000c c83e 0100 070e 000c c87a 01ff ffff 000c c886 0100 07d6
0322220 000c c8ca 01ff ffff 000c c8d6 0100 0527 000c c92e 01ff ffff 000c 8e8a 0100 06aa 000c 8eb6 0100 0540 000c 8ee6 0100 08c9
0322300 000c 8f1e 0100 08ca 000c e96e 0100 07e9 000b 44ee 01ff ffff 000c c90e 01ff ffff 000c eaaa 0100 083b 000c eaf6 0100 0412
0322360 000c 9a76 0100 0809 000c ec0a 01ff ffff 000c eca2 0100 04f3 000c ecae 0100 0616 000c ecb6 01ff ffff 000c 9d16 01ff ffff
0322440 000c edc6 0100 0737 000c ee2a 0100 0824 000c eed6 01ff ffff 000c efce 01ff ffff 000c a366 0100 05a0 000c a3a2 01ff ffff
0322520 000c efda 01ff ffff 000c a4da 01ff ffff 000c a51e 0100 08df 000c c94e 0100 0763 000c f01a 0100 07cb 000c c9be 0100 086b
```

| | | | | | | | | | | | | | | | | | | | | | | | | |
|---|---|---|---|---|---|---|---|---|---|---|---|---|---|---|---|---|---|---|---|---|---|---|---|---|
| 0322600 | 000c | ca02 | 01ff | ffff | 000d | 187e | 01ff | ffff | 000d | 2406 | 0100 | 08e2 | 000c | ef1a | 01ff | ffff | 000c | ef12 | 01ff | ffff | 000c | 6866 | 0100 | 0843 |
| 0322660 | 000c | 6892 | 0100 | 07d3 | 000c | 68c2 | 0100 | 08e9 | 000c | 68fa | 0100 | 08ea | 000c | 6936 | 0100 | 0718 | 000c | 6962 | 0100 | 07be | 000c | 6992 | 0100 | 08ed |
| 0322740 | 000c | 69ca | 0100 | 08ee | 000c | 6a06 | 01ff | ffff | 000c | 6a36 | 0100 | 0464 | 000c | 6a6a | 0100 | 08f1 | 000c | 6aa6 | 0100 | 08f2 | 000c | ef66 | 0100 | 05bc |
| 0323020 | 000d | 23fa | 01ff | ffff | 000d | 23ee | 0100 | 04be | 000d | 19be | 0100 | 0816 | 000c | ef7e | 0100 | 07a6 | 000d | 23e2 | 01ff | ffff | 000d | 23d6 | 0100 | 04c2 |
| 0323100 | 000c | ef76 | 01ff | ffff | 000c | ee8e | 0100 | 03d2 | 000c | ef02 | 01ff | ffff | 000c | ee86 | 01ff | ffff | 000c | ee36 | 0100 | 0454 | 000c | eec6 | 0100 | 016f |
| 0323160 | 000c | ee76 | 0100 | 077f | 000c | ee4e | 0100 | 0712 | 000d | 23ca | 01ff | ffff | 000c | ed0e | 0100 | 07e8 | 000c | ee1e | 0100 | 08af | 000d | 23be | 0100 | 03d0 |
| 0323240 | 000c | ec7a | 01ff | ffff | 000d | 23b2 | 01ff | ffff | 000c | ecc2 | 0100 | 02cb | 000d | 23a6 | 01ff | ffff | 000d | 239a | 0100 | 06a6 | 000c | ec6e | 0100 | 04c7 |
| 0323320 | 000d | 6992 | 0100 | 075a | 000c | effe | 0100 | 0789 | 000c | 118a | 01ff | ffff | 000d | 1816 | 01ff | ffff | 000d | 6a42 | 0100 | 08b2 | 000d | 6a4e | 0100 | 07cf |
| 0323400 | 000d | 6d66 | 01ff | ffff | 000d | 6d6e | 0100 | 04cd | 000d | 7a66 | 01ff | ffff | 000d | 8472 | 0100 | 0837 | 000d | 7b2a | 01ff | ffff | 000c | 8176 | 01ff | ffff |
| 0323460 | 000d | 7b92 | 01ff | ffff | 000d | 8466 | 0100 | 0913 | 000c | 6b3a | 01ff | ffff | 000d | 845a | 01ff | ffff | 000d | 78f2 | 0100 | 036a | 000d | 799a | 01ff | ffff |
| 0323540 | 000d | 7a76 | 0100 | 07ff | 000d | 844e | 0100 | 0227 | 000d | 6a6e | 01ff | ffff | 000d | 791e | 0100 | 07ae | 000d | 8442 | 0100 | 01eb | 000d | 79e2 | 0100 | 090c |
| 0323620 | 000d | 8436 | 0100 | 06a2 | 000c | ee46 | 0100 | 0416 | 000d | c7ce | 01ff | ffff | 000d | 6e3a | 01ff | ffff | 000d | c85e | 0100 | 06bf | 000d | 6dee | 01ff | ffff |
| 0323700 | 000d | 6b6a | 01ff | ffff | 000d | 76ea | 01ff | ffff | 000d | 83d6 | 01ff | ffff | 000d | d836 | 0100 | 0928 | 000d | 70e2 | 01ff | ffff | 000d | 246a | 01ff | ffff |
| 0323760 | 000d | d38a | 01ff | ffff | 000a | 1f4e | 01ff | ffff | 000a | 1f7e | 01ff | ffff | 000a | 1fae | 0100 | 0933 | 000a | 1fe6 | 0100 | 0934 | 000d | d39e | 0100 | 0932 |
| 0324040 | 000d | d812 | 01ff | ffff | 000d | cade | 0100 | 05a8 | 000e | 199a | 0100 | 078d | 000e | 1a2a | 01ff | ffff | 000e | 1a46 | 01ff | ffff | 000d | c8ba | 0100 | 054c |
| 0324120 | 000e | 1afe | 01ff | ffff | 000e | 1b16 | 0100 | 093e | 000e | 1c5e | 0100 | 06a5 | 000e | 1c75 | 0100 | 060f | 000e | 1c8e | 0100 | 07ce | 000e | 1d82 | 0100 | 0751 |
| 0324200 | 000e | 1e5a | 0100 | 0839 | 000e | 1fe2 | 0100 | 035d | 000e | 1fee | 0100 | 0372 | 000e | 1dce | 0100 | 08c4 | 000d | 8382 | 01ff | ffff | 000d | d86e | 0100 | 03ff |
| 0324260 | 000d | d89e | 01ff | ffff | 000d | d8d2 | 0100 | 0949 | 000d | d90e | 0100 | 094a | 000e | 1d16 | 0100 | 02de | 000e | 1d06 | 0100 | 08b5 | 000d | 69d6 | 0100 | 05ae |
| 0324340 | 000e | 1c4e | 0100 | 0473 | 000e | 1c1e | 0100 | 0658 | 000d | 6ee2 | 01ff | ffff | 000d | 6cae | 0100 | 06a8 | 000d | 6a5e | 0100 | 08bb | 000b | 088e | 0100 | 0953 |
| 0324420 | 000a | f3f6 | 01ff | ffff | 000e | 1f76 | 0100 | 05cd | 000e | 1f8a | 0100 | 0183 | 000e | 437e | 0100 | 0357 | 000e | 4456 | 0100 | 087d | 000e | 483a | 01ff | ffff |
| 0324500 | 000e | 484a | 01ff | ffff | 000e | 20e6 | 01ff | ffff | 000e | 2112 | 0100 | 0595 | 000e | 2142 | 0100 | 095d | 000e | 217a | 0100 | 095e | 000d | d7d6 | 0100 | 062f |
| 0324560 | 000d | 839a | 01ff | ffff | 000d | d7e2 | 0100 | 078b | 000d | 827a | 01ff | ffff | 000e | 6c6a | 01ff | ffff | 000e | 1fb2 | 0100 | 0923 | 000d | 82aa | 0100 | 087b |
| 0324640 | 000d | 836a | 0100 | 066d | 000e | 6cfa | 0100 | 0445 | 000e | 283e | 0100 | 039d | 000e | 287e | 0100 | 0716 | 000e | 6f66 | 0100 | 0890 | 000e | 74ae | 0100 | 033f |
| 0324720 | 000e | 6e9a | 0100 | 092f | 000e | 4b32 | 01ff | ffff | 000e | 4b5e | 01ff | ffff | 000e | 4b8e | 0100 | 096f | 000e | 4bc6 | 0100 | 0970 | 000e | 6d22 | 0100 | 07ba |
| 0325000 | 000e | 6efe | 01ff | ffff | 000e | 6ef6 | 0100 | 0591 | 000a | e5da | 0100 | 046b | 000e | 446a | 01ff | ffff | 000e | 74ba | 0100 | 0384 | 000e | 74c2 | 01ff | ffff |
| 0325060 | 000e | 74ca | 01ff | ffff | 000e | 74d2 | 0100 | 0567 | 000e | 74da | 01ff | ffff | 000e | 74e2 | 0100 | 0160 | 000e | 74ea | 01ff | ffff | 000e | 74f2 | 01ff | ffff |
| 0325140 | 000e | 74fa | 01ff | ffff | 000e | 7502 | 0100 | 065b | 000e | 750a | 0100 | 06d2 | 000e | 7512 | 01ff | ffff | 000e | 751a | 0100 | 091c | 000e | 7522 | 0100 | 0433 |
| 0325220 | 000e | 752a | 0100 | 05d9 | 000e | 7532 | 0100 | 0835 | 000e | 753a | 0100 | 062d | 000e | 7542 | 01ff | ffff | 000e | 754a | 0100 | 05f9 | 000e | 7552 | 0100 | 052f |
| 0325300 | 000e | 755a | 0100 | 08b7 | 000e | 7562 | 0100 | 0349 | 000e | 756a | 0100 | 0551 | 000e | 7572 | 0100 | 0973 | 000e | 757a | 0100 | 060c | 000e | 7582 | 01ff | ffff |
| 0325360 | 000e | 6ee6 | 0100 | 0148 | 000e | 758a | 0100 | 08f5 | 000e | 74a2 | 01ff | ffff | 000e | 7496 | 0100 | 01c3 | 000d | 7022 | 0100 | 084b | 000e | 748a | 01ff | ffff |
| 0325440 | 000d | 6aea | 01ff | ffff | 000e | 7592 | 0100 | 03ec | 000e | 747e | 0100 | 06f4 | 000e | 43c2 | 0100 | 07f5 | 000e | 759a | 01ff | ffff | 000e | 75a2 | 01ff | ffff |
| 0325520 | 000e | 800a | 0100 | 06e7 | 000e | 811a | 0100 | 0826 | 000e | 81c6 | 0100 | 01e0 | 000e | 81d2 | 01ff | ffff | 000e | 8226 | 0100 | 049e | 000e | 8232 | 0100 | 04a5 |
| 0325600 | 000e | 829a | 0100 | 0173 | 000e | 82a6 | 0100 | 0993 | 000e | 82fe | 0100 | 0632 | 000e | 8356 | 01ff | ffff | 000e | 849a | 0100 | 0966 | 000e | 84a6 | 01ff | ffff |
| 0325660 | 000e | 656e | 0100 | 09ba | 000e | 84e2 | 0100 | 08d2 | 000e | 84f2 | 0100 | 0906 | 000e | 855a | 01ff | ffff | 000e | 85be | 0100 | 04bd | 000e | 85ca | 01ff | ffff |
| 0325740 | 000e | 85d2 | 0100 | 0967 | 000e | 86b6 | 0100 | 08a8 | 000b | 2f9e | 01ff | ffff | 000b | 2fe2 | 0100 | 0828 | 000e | 869e | 0100 | 0594 | 000f | 5e2e | 0100 | 01b0 |
| 0326020 | 000f | 5e22 | 0100 | 08a6 | 000e | 851a | 01ff | ffff | 000c | f0c2 | 0100 | 04d2 | 000c | f0f2 | 0100 | 07b5 | 000c | f122 | 0100 | 09b8 | 000c | f15a | 0100 | 09b9 |
| 0326100 | 000c | f196 | 0100 | 090b | 000c | f1c2 | 0100 | 0976 | 000c | f1f2 | 0100 | 09bc | 000c | f22a | 0100 | 09bd | 000e | 8656 | 0100 | 07c7 | 000e | 85fe | 01ff | ffff |
| 0326160 | 000e | 852a | 0100 | 099b | 000e | 8566 | 0100 | 09c1 | 000e | 853a | 0100 | 09c2 | 000e | 850a | 0100 | 09c0 | 000e | 84b2 | 0100 | 084f | 000f | 5e16 | 0100 | 094e |
| 0326240 | 000f | 5e0a | 0100 | 0374 | 000f | 5dfe | 01ff | ffff | 000f | 5df2 | 01ff | ffff | 000e | 8462 | 0100 | 062b | 000e | 8436 | 0100 | 0754 | 000f | 5de6 | 0100 | 0345 |
| 0326320 | 000f | 5dda | 0100 | 0871 | 000e | 848e | 0100 | 0624 | 000e | 83fe | 0100 | 076c | 000e | 83e2 | 01ff | ffff | 000f | 5dce | 01ff | ffff | 000e | 8456 | 0100 | 05df |
| 0326400 | 000f | 61ea | 01ff | ffff | 000f | 5db6 | 0100 | 022c | 000c | f702 | 0100 | 093f | 000c | f732 | 01ff | ffff | 000c | f766 | 0100 | 09d6 | 000c | f7a2 | 0100 | 09d7 |
| 0326460 | 000f | 5daa | 01ff | ffff | 000b | 0a4e | 01ff | ffff | 000d | 18de | 0100 | 0918 | 000b | 084e | 0100 | 0919 | 000f | 8202 | 0100 | 08c6 | 000f | 8212 | 0100 | 0984 |
| 0326540 | 000f | 822a | 01ff | ffff | 000e | 6fee | 0100 | 091e | 000e | 842a | 01ff | ffff | 000e | 72ba | 0100 | 072c | 000f | 823a | 0100 | 03c9 | 000f | 824a | 0100 | 0967 |
| 0326620 | 000f | 8672 | 0100 | 090e | 000f | 8c12 | 01ff | ffff | 000f | 8d6a | 0100 | 03b2 | 000f | 9082 | 01ff | ffff | 000f | 914a | 01ff | ffff | 000f | 9412 | 0100 | 0734 |
| 0326700 | 000f | 9572 | 0100 | 09eb | 000f | 97b6 | 01ff | ffff | 000f | 98aa | 0100 | 0605 | 000f | 98fe | 0100 | 0946 | 000c | f862 | 01ff | ffff | 000f | 93ca | 0100 | 05ec |
| 0326760 | 000f | 925e | 01ff | ffff | 000f | 9b9a | 01ff | ffff | 000f | bbd6 | 01ff | ffff | 000f | 920e | 0100 | 0486 | 000f | 9b8e | 01ff | ffff | 000f | 9026 | 01ff | ffff |
| 0327040 | 000f | 9b82 | 0100 | 082c | 000f | 9ba6 | 0100 | 093a | 000f | 8e4e | 0100 | 0878 | 000f | 5d0e | 0100 | 03fa | 000f | cac6 | 0100 | 08e4 | 000f | 9a9e | 0100 | 03d9 |
| 0327120 | 000f | 9a92 | 0100 | 0458 | 000f | 5d3e | 0100 | 0831 | 000f | cbba | 01ff | ffff | 000f | cc12 | 0100 | 095c | 000f | 9a6e | 0100 | 07f4 | 000f | 9a62 | 0100 | 0892 |
| 0327200 | 000f | 5d4a | 01ff | ffff | 000f | d152 | 01ff | ffff | 000f | d7aa | 0100 | 046d | 000f | d79e | 0100 | 028a | 000f | cdd6 | 01ff | ffff | 000f | bc6e | 0100 | 0642 |
| 0327260 | 000f | d792 | 0100 | 01dd | 000f | cd4a | 0100 | 0422 | 0010 | 183e | 0100 | 02e5 | 000f | d20a | 01ff | ffff | 000f | 9a4a | 0100 | 0856 | 0010 | 1b16 | 01ff | ffff |
| 0327340 | 000f | 5d32 | 0100 | 0196 | 000f | d7e2 | 0100 | 093d | 000f | d81e | 0100 | 09bb | 000d | a816 | 0100 | 081a | 0010 | 1dba | 0100 | 097c | 000f | d8b6 | 01ff | ffff |
| 0327420 | 000f | f852 | 0100 | 0a15 | 000f | f896 | 0100 | 0834 | 0010 | 3e5a | 01ff | ffff | 0010 | 3fa6 | 01ff | ffff | 000f | 827a | 01ff | ffff | 000f | 9a86 | 0100 | 069d |
| 0327500 | 000f | c206 | 0100 | 09ab | 000f | f936 | 0100 | 0a17 | 000e | 82b2 | 01ff | ffff | 0010 | 1e5e | 01ff | ffff | 0010 | 1e9e | 0100 | 077b | 000f | 886a | 0100 | 050a |
| 0327560 | 0010 | 4216 | 0100 | 0a21 | 0010 | 624a | 01ff | ffff | 0010 | 422a | 0100 | 0a23 | 000f | 8736 | 0100 | 0a22 | 0010 | 6262 | 0100 | 0a24 | 000a | 288a | 0100 | 05ee |
| 0327640 | 000a | 28be | 0100 | 097b | 000a | 2d9e | 0100 | 0a27 | 000a | 2dd6 | 0100 | 0a28 | 0010 | 83ae | 0100 | 08c8 | 0010 | 83be | 0100 | 0814 | 000f | d702 | 01ff | ffff |

```
0327720 0010 a4d6 0100 0a02 000e 1dee 01ff ffff 000f d696 01ff ffff 000a 2e96 0100 09ae 0010 a63e 0100 0363 0010 a51a 01ff ffff
0330000 0010 a5b6 0100 0926 0010 a6ce 0100 0a31 0010 a5e2 0100 064d 000a 2f36 0100 0513 0010 a6f6 0100 088d 0010 aa92 0100 0a20
0330060 000f d5fa 01ff ffff 000f 84aa 01ff ffff 000f 84a2 0100 0743 0010 426e 0100 05de 0010 42ae 01ff ffff 0010 42f2 0100 0a1e
0330140 0010 432e 0100 0a39 0010 436a 0100 0860 0010 43a6 01ff ffff 000f d612 01ff ffff 000a 3536 01ff ffff 000f 850a 0100 0178
0330220 0010 a9fe 0100 0419 000f 8502 01ff ffff 000f d61e 0100 011b 000f 857a 0100 0965 000f 840a 0100 065f 000c 11ee 01ff ffff
0330300 000f d732 0100 05dd 000f 838a 0100 08c3 000f 8352 0100 083e 000f d62a 0100 0a2a 0010 a97e 01ff ffff 0010 a96e 0100 08f9
0330360 000f 9b16 0100 0997 000c 104e 0100 03b1 000c 1582 01ff ffff 000f 8582 01ff ffff 000f d636 0100 043e 000c 091e 0100 04c9
0330440 000f d6ae 01ff ffff 000f d642 01ff ffff 000f 9af2 01ff ffff 000f 6162 01ff ffff 000f d64e 0100 0847 000a 3546 0100 07a1
0330520 000a 378e 0100 0a3e 000a 37ca 0100 0903 000a 3432 01ff ffff 000a 31f6 0100 08f4 000a 31b2 0100 02b8 000f d65a 01ff ffff
0330600 000b 8872 0100 088c 000f 9ada 0100 0929 000b 896a 0100 0868 000f d762 01ff ffff 000f d666 01ff ffff 000f d672 0100 08dd
0330660 000f d67e 0100 0794 000e 7ce2 01ff ffff 000f d6a2 0100 0678 000f d68a 01ff ffff 000f d6ea 0100 0566 000f d6ba 0100 09b7
0330740 000f 9b22 0100 0887 000e 7be2 0100 0990 000e 7bda 01ff ffff 000f d5ee 0100 0377 000f 61aa 01ff ffff 000f 8442 0100 061f
0331020 000c 1152 0100 0908 000f 616a 0100 083a 000e 8576 01ff ffff 000e 7b3a 0100 056b 000e 7b02 0100 09de 000e 7aba 0100 09ed
0331100 0010 aa72 0100 0a5e 000f d5e2 0100 0986 0010 a8fe 0100 0759 000f 844a 0100 048b 000f d606 01ff ffff 0010 a7ba 01ff ffff
0331160 000f d5d6 0100 0925 000e 7a82 01ff ffff 000f d5ca 0100 081d 000b abbe 0100 066a 0010 443e 0100 059c 0010 d4aa 0100 00f4
0331240 0010 d50a 0100 0364 000f 5d02 0100 089d 000f d5b2 0100 09e8 000f 99a2 0100 094c 000c 0916 0100 0898 000e 83d6 0100 05fb
0331320 000f 9b52 01ff ffff 000e 6c5a 0100 085c 000f 5d6e 0100 0a57 0010 d8be 0100 078e 0010 d90e 0100 03bb 000b 88aa 0100 0a7c
0331400 0010 da3a 0100 0a7a 0010 888a 0100 088a 000b 2c86 0100 03ba 000b df1e 01ff ffff 000b 88b2 0100 076b 0010 db76 01ff ffff
0331460 000f 9b6a 0100 0940 000f 99f6 0100 0699 0010 dec6 01ff ffff 000f 5d62 01ff ffff 0010 8c3e 0100 09a5 000f 9a0e 0100 0791
0331540 000f 9a26 01ff ffff 000f 5dc2 0100 0994 000b 4046 0100 0487 000c 08fe 01ff ffff 0010 e2c6 0100 0199 0010 e392 0100 077d
0331620 0010 e3ee 0100 0599 0010 e3fa 01ff ffff 0010 e596 0100 0a76 0010 e5a6 0100 0a43 0010 e60a 0100 02d9 0010 e6a2 01ff ffff
0331700 0010 e662 0100 0158 0010 e76e 0100 0a86 0010 e7d6 01ff ffff 0010 e83a 0100 03c8 0010 e8be 0100 0602 0010 e9d6 0100 075c
0331760 0010 ea76 0100 0ab1 000a ddda 0100 0638 0010 efe6 0100 0775 0010 effe 01ff ffff 0010 9b0e 0100 0ab5 0010 f2d6 0100 0a4c
0332040 0010 8506 0100 0aa0 0010 f076 01ff ffff 0010 f042 0100 0ab9 0011 136a 0100 044d 0011 1386 0100 06e1 0010 f096 01ff ffff
0332120 0010 da1a 01ff ffff 0010 f2be 0100 0a47 0011 145e 0100 0820 0011 1476 0100 069e 0010 e86e 0100 0652 0011 150a 01ff ffff
0332200 0010 f2b2 0100 084a 0011 153e 0100 0ac1 0011 159a 0100 06be 0010 e5b2 01ff ffff 0010 f2a6 0100 094b 0011 15ee 0100 0651
0332260 0011 1626 01ff ffff 0011 163a 0100 0ac6 0011 165e 0100 01da 0011 167e 01ff ffff 0010 e4aa 0100 07f3 0010 e40a 0100 0529
0332340 0011 169e 0100 0acb 0011 17a6 0100 05cb 0011 1802 01ff ffff 0011 185a 0100 0abb 0011 1872 0100 0ad3 0011 1896 0100 0ad4
0332420 0011 1936 0100 0ad2 0010 f282 01ff ffff 0010 e0ca 01ff ffff 0011 19ce 0100 09dc 0011 1a3e 0100 0ad0 0010 f25e 0100 0362
0332500 0011 1a96 0100 0abd 0011 1ae2 0100 0438 0010 f252 0100 00e5 0011 1b36 0100 0abc 0011 1b52 0100 0adf 0011 1bea 0100 056f
0332560 0011 1c1e 0100 0ada 0010 d7f2 01ff ffff 0011 1c7a 01ff ffff 0010 f246 0100 0a8b 0011 1d0e 01ff ffff 0011 1d22 0100 0ae6
0332640 0011 1da2 0100 06ee 0011 1db6 0100 01a0 0011 1dca 0100 0ae7 0011 1e3e 0100 0ae0 0010 d41e 0100 05a3 0011 1e56 0100 09e3
0332720 0011 1e6e 0100 0aed 0011 1f02 0100 0439 0010 f23a 0100 0a80 0011 1f5a 0100 0a50 0011 1f72 0100 0aeb 0011 1f8a 01ff ffff
0333000 0011 1f9e 0100 0690 0011 203a 0100 0ae2 0011 204e 0100 0af5 0011 206a 0100 06b7 0011 207e 0100 0af6 0011 2096 0100 0af8
0333060 0011 20ae 0100 0af9 0011 20c6 0100 0afa 0011 20da 0100 0afb 0011 20f2 0100 0af2 0011 2112 0100 0afd 0011 2132 0100 01b2
0333140 0011 22b2 0100 0acc 0011 231e 0100 0516 0011 232e 01ff ffff 0011 2342 01ff ffff 0011 23c2 0100 0afe 0011 242a 0100 0a06
0333220 0011 243e 0100 0acd 0011 24c6 0100 0b05 0011 24da 0100 06d5 0011 24fa 01ff ffff 0010 f216 0100 07e6 0011 258e 01ff ffff
0333300 0011 262a 0100 0810 0011 263e 0100 0aea 0010 f1fe 01ff ffff 0011 26a2 0100 0ac9 0011 26b6 0100 0753 0011 275a 0100 0af1
0333360 0011 2776 0100 0b04 0011 2812 0100 0ad6 0011 2866 0100 0ad5 0011 2882 0100 0b14 0011 28ee 0100 0b13 0011 2942 01ff ffff
0333440 0011 295e 0100 0b16 0010 4c06 0100 0618 0011 29aa 01ff ffff 0011 2a1a 0100 0b1a 0011 2a5a 0100 0b07 0011 2a6e 0100 0b1c
0333520 0011 2ad6 01ff ffff 0011 2b82 0100 0427 0010 f1e6 01ff ffff 0010 f1da 0100 074e 0011 2c06 01ff ffff 0011 2c8e 0100 0a3f
0333600 0010 f1ce 0100 0729 0011 2d2a 0100 0afc 0011 2d46 0100 0b00 0011 2dba 0100 0ad1 0011 2e5e 0100 06c8 0011 2f06 0100 0a9d
0333660 0011 2f4a 0100 09cf 0011 2f8e 0100 0a12 0011 2f9e 0100 0b2a 0011 3022 0100 0aa7 0011 3066 01ff ffff 0011 30b6 01ff ffff
0333740 0011 310a 0100 0b25 0011 311a 0100 0b30 0011 3132 0100 0b31 0011 314a 0100 0b32 0011 3162 0100 0b33 0011 322a 0100 045b
0334020 0011 323a 01ff ffff 0011 32ca 01ff ffff 0011 331a 0100 028c 0011 332a 0100 033e 0011 33b2 0100 05ce 0010 f19e 01ff ffff
0334100 0011 3452 0100 0b12 0011 3502 0100 094d 0011 355a 01ff ffff 0011 35c2 0100 0b34 0011 35da 0100 0b15 0010 4586 0100 0b29
0334160 0011 36de 0100 059d 0011 371e 0100 0b3f 0011 373a 0100 0b43 0011 37aa 0100 0b27 0011 37f6 0100 0b26 0011 3862 0100 0adc
0334240 0011 38ee 0100 055a 0011 394a 01ff ffff 0011 398a 0100 0a9b 0011 39ce 0100 0b4a 0011 3a12 0100 0b1d 0011 3a56 0100 0b06
0334320 0011 3a9e 01ff ffff 0011 3ace 0100 09b0 0011 3b56 01ff ffff 0011 3bb2 0100 0b40 0011 3c02 0100 0b19 0010 469e 01ff ffff
0334400 0010 f17a 01ff ffff 0011 3c56 0100 087a 0011 3c6a 0100 0aa8 0011 3c7e 0100 0b48 000b 66ea 01ff ffff 0011 3d22 0100 0a9c
0334460 0010 f156 01ff ffff 0010 eaee 01ff ffff 0010 f14a 01ff ffff 0010 f13e 0100 09f4 0011 3e1e 01ff ffff 0011 3ea2 0100 0b51
0334540 0011 3f12 0100 0b5f 0011 3f6e 0100 0b47 0011 3fb2 01ff ffff 0011 3fca 0100 03c0 0011 403e 0100 0171 0011 407e 0100 0b44
0334620 0011 4096 0100 0b60 0011 40fa 0100 0649 0011 410a 01ff ffff 0010 eabe 0100 01e4 0010 3e26 0100 08b6 0011 419e 0100 0b3c
0334700 0011 41ea 0100 0b09 0011 422a 0100 0b63 000f ff2a 0100 0b65 0011 4306 0100 0ae8 0011 431a 0100 0ae9 0011 43a6 0100 03e8
0334760 0011 4412 01ff ffff 0010 f126 0100 0a6f 0011 44a2 01ff ffff 0011 4522 0100 0b52 0011 4532 01ff ffff 0011 454a 01ff ffff
```

```
0335040  0011 455a 01ff ffff 0011 4612 0100 0b76 0011 462e 0100 0b56 0011 467e 01ff ffff 0011 46be 0100 0508 0011 46ce 01ff ffff
0335120  0011 4722 0100 0b6e 0011 47b2 0100 0b66 0011 47fe 0100 0b41 0011 485e 01ff ffff 0011 486e 0100 0203 0011 48ce 0100 0ac5
0335200  0011 4936 0100 0b7f 0011 4992 0100 0b7e 0011 49b6 0100 0b85 0011 4a2e 0100 0b86 0011 4a4e 0100 0b87 0011 4ac2 0100 09c9
0335260  0011 4b36 0100 0b88 0011 4bae 0100 0b8a 0011 4c06 0100 0b6a 0011 4cfa 0100 0957 0011 4df2 0100 05d4 0011 4e36 01ff ffff
0335340  0011 4e46 01ff ffff 0011 4eca 0100 0692 0011 4ede 0100 0aef 0011 4f62 0100 0b5e 0011 4fd2 0100 07a3 0011 5016 0100 0b75
0335420  0010 1796 0100 0b95 0011 502a 0100 012f 0011 50ae 0100 098b 0011 510a 0100 0ac3 0011 5186 0100 0b8e 0011 5206 0100 0b96
0335500  0011 521a 0100 0b9b 0011 530a 0100 0b9c 0011 531e 0100 0b9d 0011 53ce 0100 0aba 0011 5432 0100 0b8b 0011 54ca 0100 0af7
0335560  0011 54da 0100 0b46 0011 554a 0100 0b45 0011 55ca 0100 0ba2 0011 5616 0100 0ba3 0010 f08a 01ff ffff 0011 56b2 0100 0b84
0335640  0011 56ce 0100 0b80 000f 9b2e 0100 0583 0011 5792 0100 0b6d 0011 57ea 0100 0ba0 000f e98a 0100 0bab 0011 58de 0100 05f0
0335720  0011 58f2 0100 0b17 0010 f06a 01ff ffff 0011 595a 0100 0ba5 0011 59b6 0100 0ba4 0011 5a2e 0100 08f7 0011 5a42 0100 0b4c
0336000  0011 5a5e 0100 0b4d 0011 5a7a 0100 0bb3 0011 5b46 0100 0b9e 0011 5bae 0100 0524 0011 5c76 0100 0b94 000f f7aa 0100 0bb6
0336060  0011 5dba 0100 0bb9 0011 5e8e 0100 0ba7 0011 5efa 0100 0bac 0011 5f86 0100 0b22 0011 5fde 0100 0b02 0011 60c6 0100 0bba
0336140  0011 60e6 0100 0bbf 0011 6156 01ff ffff 0011 6192 0100 0b1b 0011 61fe 0100 0705 0011 620e 0100 0bbc 0011 629a 0100 0662
0336220  0011 637e 0100 09c6 0011 640e 0100 0b6b 0011 642a 0100 0bb1 0011 644a 0100 0bb4 0011 64fa 0100 0bb0 0011 6622 0100 0673
0336300  0011 66be 01ff ffff 0011 6742 0100 0bc5 0011 67e6 0100 0b9a 0011 686a 0100 0bc2 0011 68b6 0100 0bc4 0011 6906 0100 0bc0
0336360  0011 694a 01ff ffff 0011 7506 0100 0ba6 0011 74fa 0100 0531 0010 f30e 0100 0a11 0010 f34e 0100 0b2b 0011 74e2 0100 061b
0336440  000a 33a6 0100 09f7 0011 74d6 0100 0829 0011 74ca 0100 050f 0011 74be 0100 0b57 0011 693a 0100 062a 0011 74b2 0100 099f
0336520  0011 68d6 01ff ffff 0011 74a6 0100 08cc 0011 67b6 0100 0bd6 0011 67d6 0100 0a48 0011 67c6 0100 0a6b 000f cf72 0100 0aa3
0336600  0011 753e 01ff ffff 0011 757e 0100 08c5 0011 75c2 0100 0be2 0011 7606 0100 0d0e 0011 764e 0100 0889 0011 768a 0100 0be7
0336660  0011 be06 01ff ffff 0010 182a 0100 032a 0011 64d6 0100 0be5 0011 737a 0100 07b4 0011 9572 0100 0be9 0011 667e 0100 0a6e
0336740  0011 65e2 0100 0153 000d 94d6 0100 0a10 0011 669e 0100 0a4d 0011 69be 0100 0a46 0012 0036 0100 0bf3 0011 6776 0100 074d
0337020  0011 bf0a 0100 0bbd 0011 7386 0100 03b6 0012 00f2 0100 0bf6 0011 635e 0100 0a97 0011 631e 0100 05b3 0011 628a 0100 0870
0337100  0012 0146 01ff ffff 0012 015a 0100 0b0f 000e 48ba 0100 0982 0011 627a 0100 0881 0011 622a 0100 0541 0012 025a 0100 0992
0337160  0012 030a 0100 0116 0012 033e 0100 0c02 0012 0352 0100 0bfd 0011 73b6 0100 0661 0012 03c6 0100 0812 0012 03da 0100 0bb8
0337240  0012 042e 0100 05c4 0011 743a 0100 085e 0011 6016 0100 0b98 0012 046a 0100 0845 0011 5fce 0100 043d 0012 047e 0100 0414
0337320  000b ae1e 01ff ffff 0012 0492 0100 06d6 0012 04a6 01ff ffff 0011 5eda 0100 02e8 0011 5eca 0100 0714 0012 05ba 0100 09a8
0337400  0012 05ce 01ff ffff 0011 7446 0100 0b23 0012 05e2 0100 040c 0011 5df6 0100 09f5 0012 06da 0100 0bde 0012 06ee 0100 0666
0337460  0011 5d12 0100 02fd 0011 5cae 01ff ffff 0011 5c56 0100 051a 0012 078e 0100 052d 0012 07a2 0100 07de 0011 5c46 01ff ffff
0337540  0012 07b6 0100 0b35 0011 5bee 0100 0bbe 0011 73da 01ff ffff 000a db5a 0100 01a9 0012 08ea 0100 0945 0012 08fe 0100 0bfb
0337620  0012 0916 01ff ffff 0011 5b2a 01ff ffff 0012 09ce 0100 0b59 0011 58be 0100 0c03 0011 73f2 0100 067d 0011 58ae 0100 0c19
0337700  0011 588e 01ff ffff 0012 0aaa 0100 0a73 0011 584e 0100 08aa 0012 0b1e 0100 0a69 0012 0b52 0100 06ba 0012 0b6a 0100 0c1a
0337760  0012 0b7e 0100 0969 0011 57aa 0100 09e7 000a dc9e 0100 0104 0011 7482 01ff ffff 0012 0c1e 0100 07ef 000e 844e 01ff ffff
0340040  0011 559a 0100 05b1 0011 7362 01ff ffff 0011 1a86 01ff ffff 0011 558a 0100 0999 0011 551a 01ff ffff 0011 547a 01ff ffff
0340120  0012 0e92 01ff ffff 0011 d966 0100 066b 0012 0f66 0100 0c2d 0011 5142 0100 08d7 0011 7326 0100 06d4 0012 104e 01ff ffff
0340200  0011 50ea 01ff ffff 0011 505e 0100 0ae3 0011 9756 01ff ffff 0012 1122 0100 0622 0012 1162 01ff ffff 0011 4e5a 0100 0bf2
0340260  0012 1196 0100 0c06 0011 4d72 0100 0bf0 0011 4d2a 0100 0c2c 0012 122a 0100 0c4a 0012 1262 0100 0b97 0012 12ba 0100 0a64
0340340  0011 730e 0100 0912 0012 1362 0100 0c41 0012 13be 0100 0952 0011 49fe 0100 0896 0011 7062 0100 0936 0011 4972 0100 0b24
0340420  0011 706e 0100 0713 000a deaa 01ff ffff 0011 707a 0100 0956 0011 df76 0100 0c55 0011 dfba 0100 099a 0011 e002 01ff ffff
0340500  0011 e042 0100 0c27 0011 e086 0100 07aa 0011 e0c2 0100 09c5 0011 e102 0100 07e3 0011 e142 01ff ffff 0011 7086 0100 0179
0340560  0012 34ca 01ff ffff 0011 bf7a 01ff ffff 0012 141a 01ff ffff 0012 36ae 0100 0637 0012 142e 0100 0b21 0012 3776 01ff ffff
0340640  0012 37f2 01ff ffff 0012 386e 0100 05ac 0012 38ea 0100 041e 0011 5252 0100 0a26 0012 3962 0100 0c6a 0011 53e2 0100 0c6c
0340720  0012 39da 0100 051f 0012 3a5e 01ff ffff 0011 5762 0100 01cd 0011 587e 01ff ffff 0012 3cae 0100 0c69 0012 3d7a 0100 0520
0341000  0012 3df2 0100 0c6e 0011 70b6 01ff ffff 0011 62ba 0100 0140 0012 4126 0100 0c72 0012 419e 0100 0c74 0011 483e 0100 0c44
0341060  0012 432a 0100 01c5 0012 443e 0100 0c78 0012 44c2 0100 0c6f 0012 45da 0100 0c20 0012 4652 0100 08f8 0011 70e6 0100 076d
0341140  0011 70f2 01ff ffff 0011 4336 01ff ffff 0011 42c6 01ff ffff 0011 4246 0100 089f 0012 48c2 0100 0c7b 0011 70fe 0100 0a35
0341220  0011 3fa2 0100 077a 0011 3eda 0100 040d 0012 4b3a 01ff ffff 0012 4bbe 0100 0c84 0012 4c42 0100 08ff 0012 4c76 0100 0c5c
0341300  0012 4c8e 0100 034b 0012 4cba 01ff ffff 0012 4342 0100 04d6 000a deb2 0100 0a83 0012 4d9e 0100 06ff 0011 3bf2 01ff ffff
0341360  0011 3b06 0100 0c0a 0012 4fee 0100 0c18 0011 392a 01ff ffff 000d fa6e 01ff ffff 0011 710a 0100 0988 0012 5146 0100 0156
0341440  0011 e1da 0100 0c5a 0011 73c2 0100 06d7 0011 51ba 0100 0b08 0012 7456 0100 0bf4 0012 74c6 01ff ffff 0012 7532 01ff ffff
0341520  0012 759e 0100 0665 0012 75ea 0100 0bf8 0012 766e 0100 0b99 0011 4cda 01ff ffff 0012 76f2 0100 0985 0011 4b16 0100 0607
0341600  0012 7776 0100 0bfc 0012 77c2 0100 0b68 0012 77f6 0100 0bad 0011 43e2 0100 0585 0011 42d6 0100 0a82 0012 782a 0100 0c65
0341660  0012 789e 0100 0c30 0012 78b2 0100 0ca9 0011 413e 0100 0c1b 000b 39e6 0100 0825 0012 79a6 0100 037d 0011 7092 0100 0c46
0341740  000b 3c6a 01ff ffff 000b 3d16 0100 0c54 000b 3dc2 0100 03f4 0011 3c92 0100 0b72 0011 3b92 0100 0779 0011 39e2 0100 0c9f
0342020  0011 39be 0100 0bdb 000b 3ed2 0100 0cb4 000a f44a 0100 0cb2 000b 01ce 0100 0c23 000b 1fce 0100 0cb0 000b 2636 0100 0cb1
0342100  000b 4a7a 0100 0cb8 000b 4a96 0100 0cbb 000b 4fae 0100 02b3 000b 513a 0100 0907 000b 51e6 01ff ffff 000b 5256 0100 09d4
```

| | | | | | | | | | | | | | | | | | | | | | | | | |
|---|---|---|---|---|---|---|---|---|---|---|---|---|---|---|---|---|---|---|---|---|---|---|---|---|
| 0342160 | 000b | 5272 | 0100 | 0962 | 0011 | 30fa | 0100 | 0955 | 000b | 55fe | 0100 | 07fd | 000b | 5452 | 01ff | ffff | 000b | 5826 | 0100 | 0c6b | 000b | 584a | 0100 | 0951 |
| 0342240 | 000b | 5c26 | 0100 | 04f4 | 000b | 5c8a | 0100 | 090d | 000b | 5156 | 01ff | ffff | 000b | 5e16 | 0100 | 0910 | 000b | 5fba | 0100 | 0cc4 | 000b | 5f6e | 0100 | 0c64 |
| 0342320 | 000b | 61ac | 0100 | 0cc5 | 000b | 61ca | 0100 | 09f2 | 000b | 64ce | 0100 | 0cc0 | 0011 | 2d8a | 0100 | 0cad | 000b | 5206 | 0100 | 09bf | 000b | 6ea2 | 0100 | 061a |
| 0342400 | 000b | 4b06 | 0100 | 0cc2 | 000b | 5a72 | 0100 | 0b3a | 000b | 733e | 0100 | 0ccb | 000b | 73de | 0100 | 0cd5 | 0011 | 2372 | 0100 | 0cd0 | 000b | 7632 | 0100 | 0609 |
| 0342460 | 0010 | e93e | 0100 | 0cce | 0010 | e77e | 0100 | 0a5a | 000b | 7952 | 0100 | 0a65 | 000b | 7966 | 0100 | 06ce | 0010 | e2d2 | 0100 | 048f | 0010 | e26e | 0100 | 0c43 |
| 0342540 | 0010 | e192 | 01ff | ffff | 0010 | e142 | 01ff | ffff | 0010 | d962 | 0100 | 0ca0 | 000b | 7d8e | 0100 | 0cab | 000b | 7e22 | 01ff | ffff | 000b | 7ed2 | 0100 | 0657 |
| 0342620 | 000b | 7f56 | 0100 | 0c31 | 000b | 7ffe | 0100 | 0ce4 | 0010 | d68e | 0100 | 0c8b | 0012 | 9b3a | 0100 | 0c89 | 0012 | 149e | 0100 | 08db | 000d | 4d6a | 01ff | ffff |
| 0342700 | 0010 | d86e | 0100 | 0ce9 | 000d | 4d8e | 0100 | 06a7 | 0010 | ef9a | 0100 | 06f3 | 0011 | 2496 | 01ff | ffff | 0011 | 2672 | 01ff | ffff | 0011 | 297a | 0100 | 0a0b |
| 0342760 | 0012 | 5232 | 0100 | 0ccd | 0012 | bc9e | 0100 | 0ce3 | 0012 | bcd2 | 0100 | 0c77 | 0012 | bce6 | 0100 | 0cec | 000b | 7b82 | 0100 | 0c7c | 0012 | bd62 | 0100 | 0c4f |
| 0343040 | 0012 | bd96 | 0100 | 04ea | 0012 | bdca | 0100 | 0c40 | 0012 | be02 | 01ff | ffff | 0012 | be36 | 0100 | 0c63 | 0012 | be6e | 0100 | 0cf2 | 0012 | bea6 | 0100 | 0cf3 |
| 0343120 | 0012 | bee2 | 0100 | 0cf4 | 0012 | bf1e | 0100 | 0cf5 | 0012 | bf82 | 01ff | ffff | 0011 | 70a6 | 0100 | 0c94 | 0011 | 406e | 01ff | ffff | 0012 | bff6 | 0100 | 01a3 |
| 0343200 | 0011 | 4452 | 0100 | 084c | 0012 | c04a | 01ff | ffff | 0012 | c07e | 0100 | 0c10 | 0012 | c0b2 | 0100 | 0ce6 | 0012 | c0ea | 0100 | 0cfe | 0012 | c122 | 0100 | 0cff |
| 0343260 | 0012 | c182 | 0100 | 0cf6 | 0011 | 5152 | 01ff | ffff | 0012 | c1d6 | 0100 | 0844 | 0012 | c20a | 0100 | 0cf9 | 0012 | c25e | 0100 | 096b | 0012 | c2b2 | 0100 | 0cfb |
| 0343340 | 0012 | c306 | 0100 | 0cfc | 0012 | c35a | 0100 | 0cfd | 0012 | c3b2 | 0100 | 0d08 | 0012 | c40a | 0100 | 0d09 | 0012 | c49a | 0100 | 0d13 | 0012 | c50e | 01ff | ffff |
| 0343420 | 0012 | c55e | 0100 | 0cef | 0012 | c5b2 | 0100 | 0920 | 0012 | c602 | 0100 | 0cf1 | 0012 | c656 | 0100 | 0d10 | 0012 | c6ca | 0100 | 0d12 | 0012 | c722 | 0100 | 0d14 |
| 0343500 | 0012 | c7b2 | 0100 | 0d0a | 0012 | c826 | 0100 | 0cf8 | 0012 | c87a | 0100 | 010d | 0012 | c8ce | 0100 | 0cfa | 0012 | c922 | 0100 | 0d0f | 0012 | c976 | 0100 | 0d19 |
| 0343560 | 0012 | c9ee | 0100 | 0d1a | 0012 | ca46 | 0100 | 0d1b | 0012 | cab6 | 0100 | 0832 | 0012 | cae6 | 0100 | 0a05 | 0012 | cb26 | 0100 | 0c9d | 0012 | cb86 | 0100 | 09a4 |
| 0343640 | 000d | 4a6a | 0100 | 056a | 0012 | 9ba2 | 0100 | 0b5d | 0012 | 9be2 | 0100 | 0aa4 | 0012 | cb56 | 01ff | ffff | 0012 | cad6 | 0100 | 0d2b | 0012 | ec02 | 0100 | 06e2 |
| 0343720 | 0012 | c9ce | 0100 | 0d2d | 0012 | e10e | 0100 | 0623 | 0012 | ed2a | 0100 | 0d07 | 0012 | ed46 | 0100 | 0d2e | 0012 | edde | 0100 | 0d31 | 0012 | ee36 | 0100 | 0d32 |
| 0344000 | 0012 | ee92 | 0100 | 0d33 | 0012 | ef1e | 0100 | 0c07 | 0012 | ef5a | 0100 | 0d35 | 0012 | ef7a | 0100 | 0d2c | 0012 | efd2 | 0100 | 0a98 | 0012 | f006 | 0100 | 0d37 |
| 0344060 | 0012 | f03e | 0100 | 0c80 | 0012 | f07e | 0100 | 0d2f | 0012 | f09a | 0100 | 0d30 | 0012 | f12e | 0100 | 0d36 | 0012 | f16a | 0100 | 0d3d | 0012 | f18a | 0100 | 0d39 |
| 0344140 | 0012 | f1e2 | 01ff | ffff | 0012 | f216 | 0100 | 0d3f | 0012 | f292 | 0100 | 0d22 | 0012 | a72a | 0100 | 0b49 | 0012 | a75a | 01ff | ffff | 0012 | a78e | 0100 | 0d43 |
| 0344220 | 0012 | a7ca | 0100 | 0d44 | 000d | 4ab2 | 0100 | 0bdf | 000d | 4abe | 01ff | ffff | 000d | 4aca | 0100 | 0c28 | 000d | 4ae2 | 0100 | 06fa | 0011 | 366a | 0100 | 0b5b |
| 0344300 | 000d | 4aee | 0100 | 07bd | 000d | 4afa | 0100 | 0ba9 | 0013 | 3376 | 0100 | 0875 | 000d | 4b2a | 0100 | 0a7d | 0011 | 375a | 01ff | ffff | 0013 | 374e | 0100 | 0d41 |
| 0344360 | 0013 | 37b2 | 0100 | 0b0a | 0012 | a42a | 0100 | 040e | 0011 | 347e | 0100 | 0d2a | 000d | 4caa | 0100 | 03e7 | 0012 | 9c7e | 0100 | 0695 | 000a | 3462 | 0100 | 09fd |
| 0344440 | 0012 | cbe6 | 0100 | 0a54 | 0012 | cc26 | 0100 | 0c61 | 0012 | cc66 | 0100 | 0d56 | 0012 | ccae | 0100 | 0ca4 | 0012 | ccf6 | 0100 | 0bce | 0012 | cd32 | 0100 | 018b |
| 0344520 | 0013 | 7886 | 01ff | ffff | 000d | 4c92 | 0100 | 0335 | 000d | 4bf6 | 01ff | ffff | 0013 | 78a2 | 0100 | 08fa | 0013 | 7972 | 0100 | 0848 | 0012 | c46a | 0100 | 07df |
| 0344600 | 0012 | c4ce | 0100 | 0d62 | 0012 | c6aa | 0100 | 0a25 | 000d | 4ad6 | 0100 | 021b | 0013 | 7c3a | 01ff | ffff | 0013 | 7c5a | 0100 | 0d61 | 0012 | cdca | 01ff | ffff |
| 0344660 | 0013 | 7cb2 | 01ff | ffff | 0012 | c702 | 0100 | 09fe | 0013 | 7cca | 0100 | 00f2 | 0013 | 7d3e | 0100 | 0d6a | 0012 | c3ea | 0100 | 0611 | 000d | 4c1a | 01ff | ffff |
| 0344740 | 0013 | 7e02 | 0100 | 064b | 000d | 4c26 | 01ff | ffff | 0012 | caa6 | 0100 | 0caa | 0013 | 7e9e | 0100 | 0164 | 0013 | 7eb2 | 01ff | ffff | 0012 | cb16 | 0100 | 0d74 |
| 0345020 | 0012 | ca26 | 0100 | 0711 | 0013 | 7f6a | 01ff | ffff | 0013 | 7fc2 | 0100 | 0cdf | 0013 | 807a | 0100 | 0cd9 | 0013 | 8136 | 01ff | ffff | 0013 | 814e | 0100 | 058e |
| 0345100 | 0013 | 81aa | 0100 | 0d7a | 0013 | 8222 | 0100 | 0d7b | 0013 | 825a | 0100 | 0d7c | 0013 | 827a | 0100 | 0d7d | 0013 | 82de | 0100 | 0d5b | 0013 | 38ce | 01ff | ffff |
| 0345160 | 0013 | a33e | 01ff | ffff | 000d | 4ce6 | 0100 | 0c4b | 0013 | 8002 | 01ff | ffff | 000d | 4cc2 | 01ff | ffff | 0013 | 8322 | 01ff | ffff | 0013 | 835e | 0100 | 089e |
| 0345240 | 0013 | 839a | 01ff | ffff | 0013 | 83d6 | 0100 | 0562 | 0013 | e72a | 01ff | ffff | 0013 | e742 | 0100 | 0d8a | 000d | 4cb6 | 0100 | 0484 | 0013 | e7ba | 0100 | 04fa |
| 0345320 | 0013 | e806 | 0100 | 0475 | 0013 | 58d6 | 01ff | ffff | 000d | 433a | 0100 | 01bd | 0013 | 846e | 0100 | 0491 | 0014 | 088e | 0100 | 0894 | 0011 | 41fa | 0100 | 0d73 |
| 0345400 | 0014 | 090a | 0100 | 0d91 | 000b | 563e | 0100 | 0d94 | 0014 | 0962 | 0100 | 0d93 | 0011 | 4fb2 | 0100 | 0d77 | 0014 | 0a1e | 0100 | 0472 | 0014 | 0a52 | 01ff | ffff |
| 0345460 | 0012 | c806 | 0100 | 0555 | 0012 | c762 | 0100 | 0494 | 0014 | 0b16 | 0100 | 0902 | 0014 | 0b6e | 0100 | 03cd | 0014 | 0b82 | 0100 | 0c7a | 0010 | f2ca | 01ff | ffff |
| 0345540 | 000d | 4a46 | 0100 | 0580 | 000d | 4a52 | 0100 | 09a7 | 000d | 4a5e | 0100 | 07e4 | 0013 | c74e | 0100 | 0790 | 0013 | c78e | 0100 | 0c8d | 0013 | c7d2 | 01ff | ffff |
| 0345620 | 0013 | c812 | 0100 | 0950 | 0013 | c856 | 0100 | 05c1 | 0013 | c892 | 0100 | 074f | 0014 | 0c1a | 01ff | ffff | 0014 | 0c32 | 0100 | 0a56 | 0012 | c4ee | 0100 | 0cc8 |
| 0345700 | 0011 | 3a46 | 01ff | ffff | 0014 | 0cca | 01ff | ffff | 0013 | a772 | 0100 | 0771 | 0013 | e7d6 | 0100 | 0895 | 0014 | 0dae | 0100 | 0bf7 | 0014 | 0e02 | 0100 | 07a2 |
| 0345760 | 0014 | 0e5a | 0100 | 05ab | 0014 | 0e8e | 0100 | 0587 | 0014 | 0ec2 | 01ff | ffff | 0014 | 0ef6 | 0100 | 0d4b | 0014 | 0f96 | 0100 | 0db5 | 0011 | 2e2e | 0100 | 0874 |
| 0346040 | 0014 | 10ce | 0100 | 0db6 | 0014 | 10e6 | 0100 | 0db1 | 0014 | 1106 | 0100 | 0db2 | 0014 | 1182 | 01ff | ffff | 000d | 4352 | 01ff | ffff | 0014 | 1252 | 0100 | 0db8 |
| 0346120 | 0014 | 1266 | 01ff | ffff | 0014 | 127a | 01ff | ffff | 0013 | d3c6 | 0100 | 0c2a | 0013 | d3f6 | 0100 | 00e1 | 0014 | 130a | 0100 | 03dc | 0014 | 1366 | 0100 | 02cc |
| 0346200 | 0014 | 13d6 | 0100 | 0db3 | 0013 | cf82 | 0100 | 05e6 | 0010 | da4a | 0100 | 0da4 | 000d | 4986 | 0100 | 01b6 | 0013 | e91e | 0100 | 06db | 0013 | e94e | 0100 | 0981 |
| 0346260 | 0013 | e982 | 0100 | 0dc8 | 0013 | e9be | 0100 | 0dc9 | 0010 | e372 | 0100 | 0bcc | 000d | 499e | 01ff | ffff | 000d | 49aa | 01ff | ffff | 0013 | c92a | 0100 | 03d7 |
| 0346340 | 000d | 49b6 | 0100 | 058a | 0011 | 22ee | 0100 | 0674 | 0011 | 27b2 | 0100 | 01c8 | 0011 | 2b12 | 0100 | 0d9c | 000d | 4d46 | 01ff | ffff | 0014 | 12ca | 0100 | 0c01 |
| 0346420 | 000d | 49c2 | 0100 | 0cca | 0013 | e7fe | 0100 | 0cbc | 000d | 49ce | 0100 | 0da1 | 0011 | 2d1a | 0100 | 08e8 | 000d | 49da | 0100 | 0346 | 0011 | 2c1e | 0100 | 067c |
| 0346500 | 000d | 49e6 | 01ff | ffff | 0011 | 2e96 | 0100 | 0d50 | 0011 | 44d6 | 0100 | 08f0 | 0011 | 4af6 | 0100 | 097a | 0012 | c902 | 0100 | 0781 | 0011 | 4c3a | 01ff | ffff |
| 0346560 | 0012 | cac6 | 01ff | ffff | 000d | 49f2 | 01ff | ffff | 000d | 49fe | 01ff | ffff | 000c | b0c6 | 0100 | 0998 | 000c | aff2 | 0100 | 034d | 000b | 80c2 | 01ff | ffff |
| 0346640 | 000e | 8666 | 01ff | ffff | 0014 | 7c8e | 0100 | 0646 | 0014 | 7c9e | 0100 | 0d04 | 0013 | cfae | 0100 | 0c3d | 0014 | 7cae | 0100 | 0b0c | 0014 | 7cc2 | 01ff | ffff |
| 0346720 | 0014 | 7cd2 | 0100 | 0adb | 0014 | 7ce2 | 0100 | 08cd | 0014 | 7d86 | 0100 | 0bed | 0010 | d51a | 0100 | 0586 | 0014 | 7efe | 0100 | 0d53 | 0013 | fd3a | 0100 | 0a1c |
| 0347000 | 0014 | 7f82 | 0100 | 02e4 | 0014 | 7f8e | 01ff | ffff | 0014 | 8072 | 0100 | 0a81 | 000c | 021a | 01ff | ffff | 000c | 0212 | 0100 | 098f | 0014 | 829e | 01ff | ffff |
| 0347060 | 0014 | 82aa | 0100 | 095a | 0014 | 8362 | 0100 | 01c4 | 0014 | 83be | 0100 | 0d11 | 0014 | 83ca | 0100 | 0c15 | 0014 | 851a | 0100 | 06f6 | 0014 | 85be | 0100 | 0b9f |
| 0347140 | 0014 | 8616 | 0100 | 09f1 | 0014 | 8642 | 0100 | 07b3 | 0014 | 86d6 | 01ff | ffff | 0014 | 87aa | 0100 | 087f | 0014 | 88de | 0100 | 04a3 | 0014 | 8972 | 0100 | 0359 |
| 0347220 | 000e | 1df6 | 01ff | ffff | 0013 | b15e | 0100 | 0886 | 0014 | 8a3a | 01ff | ffff | 0013 | b18a | 01ff | ffff | 0013 | b1be | 0100 | 0e09 | 0013 | b1ea | 0100 | 0e08 |

| | | | | | | | | | | | | | | | | | | | | | | | | |
|---|---|---|---|---|---|---|---|---|---|---|---|---|---|---|---|---|---|---|---|---|---|---|---|---|
| 0347300 | 0014 | 8a6a | 01ff | ffff | 000a | 25da | 0100 | 011c | 0014 | 8ac6 | 0100 | 0c92 | 0014 | 8b72 | 01ff | ffff | 0014 | 8b7e | 0100 | 0c82 | 0013 | bf96 | 0100 | 0795 |
| 0347360 | 0013 | bfda | 0100 | 0e11 | 0014 | 9386 | 0100 | 0c12 | 0014 | 8bfe | 0100 | 0577 | 0015 | 405e | 0100 | 0670 | 0014 | 3416 | 0100 | 0be4 | 0014 | 346e | 0100 | 0bec |
| 0347440 | 0014 | 349e | 0100 | 0e16 | 0014 | 34d6 | 0100 | 0e17 | 0015 | 4056 | 0100 | 0e04 | 000c | 048e | 01ff | ffff | 0015 | 4042 | 0100 | 0000 | 0014 | 8baa | 01ff | ffff |
| 0347520 | 0014 | 8a5a | 0100 | 089a | 0014 | 8ad2 | 01ff | ffff | 0015 | 82ae | 0100 | 072d | 000f | d19a | 0100 | 0876 | 0014 | 8892 | 01ff | ffff | 0015 | 3f6a | 01ff | ffff |
| 0347600 | 0014 | 885a | 0100 | 040f | 0014 | 8316 | 0100 | 07ee | 0015 | 353e | 01ff | ffff | 0015 | 85f6 | 0100 | 0e25 | 0015 | 3f46 | 0100 | 0400 | 0015 | 3f3a | 01ff | ffff |
| 0347660 | 0014 | 4bae | 0100 | 09ff | 0014 | 4bf2 | 0100 | 0e0f | 000e | 440a | 0100 | 0c4e | 0015 | 3f2e | 0100 | 02a9 | 0014 | 7dda | 01ff | ffff | 000c | 2406 | 0100 | 0d45 |
| 0347740 | 0014 | 7dba | 0100 | 0472 | 0015 | 3e3e | 0100 | 0aa1 | 0015 | a74a | 01ff | ffff | 0015 | 3e4a | 0100 | 08ab | 0015 | aa7a | 0100 | 0421 | 0015 | aa96 | 0100 | 04ee |
| 0350020 | 0015 | aab6 | 0100 | 04d8 | 0015 | a72a | 01ff | ffff | 0015 | 407e | 01ff | ffff | 0015 | aace | 0100 | 00dd | 0015 | aaf6 | 0100 | 0da6 | 0015 | 3e56 | 0100 | 0d54 |
| 0350100 | 0015 | 86c6 | 0100 | 0e3a | 0015 | ab6e | 0100 | 02f7 | 0015 | ab8e | 0100 | 0137 | 0015 | abb6 | 0100 | 037e | 0015 | a75a | 0100 | 09c4 | 0014 | 7e1a | 0100 | 0dbb |
| 0350160 | 0015 | abf6 | 0100 | 0a0a | 0015 | a76e | 0100 | 08ad | 0014 | 827e | 01ff | ffff | 0015 | ac1e | 0100 | 07d1 | 0015 | ac32 | 0100 | 0e43 | 0015 | ace6 | 0100 | 0d4e |
| 0350240 | 0015 | ad0a | 01ff | ffff | 0015 | ad96 | 01ff | ffff | 0015 | a3f2 | 0100 | 091a | 0015 | ae76 | 0100 | 0813 | 0014 | 8456 | 0100 | 06c6 | 0015 | af4a | 0100 | 0e1b |
| 0350320 | 0015 | af5e | 0100 | 0d64 | 0015 | af72 | 01ff | ffff | 0014 | 8486 | 0100 | 0aca | 0015 | b046 | 0100 | 0ddd | 0015 | b056 | 0100 | 09fa | 0015 | b072 | 0100 | 0d63 |
| 0350400 | 0015 | b086 | 0100 | 0e4b | 0015 | b0a2 | 0100 | 0db9 | 0015 | b0be | 0100 | 0dba | 0015 | b0d6 | 01ff | ffff | 0015 | b0e6 | 0100 | 040b | 0015 | b1c6 | 01ff | ffff |
| 0350460 | 0014 | 880e | 01ff | ffff | 0015 | 473e | 0100 | 047b | 0015 | b236 | 0100 | 0c9e | 0015 | 3e7a | 0100 | 07b9 | 0015 | 4892 | 01ff | ffff | 000e | 40ee | 0100 | 07e0 |
| 0350540 | 0015 | b2ba | 01ff | ffff | 0015 | b2e2 | 0100 | 0e5b | 0015 | b3d2 | 0100 | 03ee | 0015 | 3e86 | 01ff | ffff | 0015 | b3f6 | 0100 | 0e4d | 0015 | b45e | 0100 | 0c91 |
| 0350620 | 0014 | 8836 | 0100 | 0341 | 0014 | 9816 | 0100 | 0523 | 0015 | b5be | 01ff | ffff | 0015 | b5ce | 0100 | 0c1d | 0015 | b646 | 01ff | ffff | 0015 | b64e | 0100 | 0495 |
| 0350700 | 0015 | b6b6 | 0100 | 048d | 0015 | b70e | 0100 | 098c | 0015 | 53fe | 0100 | 0d49 | 0015 | b76e | 01ff | ffff | 0015 | b776 | 0100 | 098d | 0014 | 8526 | 0100 | 0b0e |
| 0350760 | 0015 | b7ce | 0100 | 045e | 0015 | 52ce | 0100 | 0df4 | 0015 | 3ec2 | 0100 | 04e2 | 0015 | b852 | 0100 | 0c38 | 0015 | b866 | 0100 | 0e52 | 0015 | b8b2 | 0100 | 0656 |
| 0351040 | 0015 | b91a | 0100 | 0e75 | 0015 | 4af6 | 0100 | 09ca | 0015 | b986 | 0100 | 0e64 | 0015 | 55c6 | 01ff | ffff | 0015 | ba12 | 0100 | 0d25 | 0015 | ba76 | 0100 | 09be |
| 0351120 | 0015 | ba8e | 0100 | 0e7d | 0015 | baa6 | 01ff | ffff | 0015 | babe | 0100 | 060e | 0015 | bad6 | 0100 | 0e7e | 0015 | 3ece | 0100 | 0961 | 0015 | bae6 | 0100 | 0ad9 |
| 0351200 | 0015 | a742 | 0100 | 09e5 | 0015 | 57a6 | 0100 | 0e42 | 0015 | bb52 | 0100 | 0bea | 0015 | bb62 | 0100 | 0901 | 0015 | bb76 | 0100 | 0900 | 0014 | 859e | 0100 | 0ce2 |
| 0351260 | 0015 | a722 | 0100 | 0805 | 0015 | bbde | 0100 | 0e88 | 0015 | bb1a | 0100 | 0e3c | 0015 | bc86 | 0100 | 0c8e | 0015 | bc46 | 0100 | 0557 | 0015 | b94e | 0100 | 0ab4 |
| 0351340 | 0015 | bc3a | 0100 | 075d | 0015 | b8a2 | 0100 | 0b54 | 0013 | e8de | 01ff | ffff | 0015 | b7d6 | 01ff | ffff | 0015 | bc5e | 0100 | 0ac0 | 0015 | b79e | 0100 | 0b7b |
| 0351420 | 0014 | 857a | 01ff | ffff | 0015 | bc66 | 0100 | 08a2 | 0015 | bc6e | 0100 | 04e9 | 0015 | 45fe | 0100 | 0995 | 000e | 4412 | 0100 | 0cbd | 0015 | a73a | 0100 | 0e9a |
| 0351500 | 0015 | 3d8a | 0100 | 03f8 | 0015 | 3d96 | 0100 | 073e | 0015 | 3da2 | 0100 | 07a0 | 0015 | 3eaa | 0100 | 0672 | 0014 | 812a | 0100 | 0600 | 0015 | 3dba | 0100 | 0e86 |
| 0351560 | 0015 | 3f52 | 01ff | ffff | 0014 | 802e | 0100 | 04b0 | 0015 | b4a2 | 01ff | ffff | 0015 | b472 | 0100 | 0855 | 0015 | b40e | 0100 | 04c0 | 0015 | b386 | 0100 | 06a3 |
| 0351640 | 0015 | b356 | 0100 | 088f | 0015 | b326 | 0100 | 039f | 0015 | b2f6 | 01ff | ffff | 0015 | b28a | 0100 | 0de2 | 0015 | b246 | 01ff | ffff | 0015 | 3e32 | 0100 | 07c0 |
| 0351720 | 0015 | bc52 | 0100 | 0c57 | 0015 | 62d2 | 01ff | ffff | 0015 | 6312 | 0100 | 0ceb | 0015 | b4ea | 01ff | ffff | 0015 | 63ee | 0100 | 0bcd | 0015 | 6422 | 01ff | ffff |
| 0352000 | 0015 | b9be | 0100 | 0e15 | 0015 | b206 | 0100 | 035b | 0015 | b1d6 | 0100 | 092e | 0015 | 3fb2 | 01ff | ffff | 0015 | 3f0a | 0100 | 0a03 | 0015 | 664a | 01ff | ffff |
| 0352060 | 0015 | 667a | 0100 | 0ce8 | 0015 | 66ae | 0100 | 0941 | 0015 | 66de | 0100 | 0eb0 | 0015 | 6712 | 0100 | 0eb9 | 0015 | 674e | 0100 | 0eba | 0016 | 1dde | 0100 | 0c26 |
| 0352140 | 0016 | 1f96 | 01ff | ffff | 0016 | 1f7e | 0100 | 0849 | 0016 | 226e | 0100 | 0acf | 0016 | 22f6 | 0100 | 047d | 0016 | 1ea2 | 0100 | 0ebe | 0016 | 43fe | 0100 | 0eb3 |
| 0352220 | 0016 | 4546 | 0100 | 0c7f | 0016 | 4562 | 01ff | ffff | 0015 | 64da | 0100 | 07a7 | 0016 | 43e6 | 01ff | ffff | 0016 | 43f6 | 0100 | 0960 | 0016 | 453a | 01ff | ffff |
| 0352300 | 0016 | 452e | 0100 | 0e13 | 0015 | 583e | 01ff | ffff | 0016 | 4522 | 0100 | 05d7 | 0015 | 3f16 | 0100 | 0c16 | 0016 | 45ba | 0100 | 0b0b | 0016 | 4666 | 0100 | 0e9d |
| 0352360 | 0016 | 4676 | 0100 | 0e1d | 0016 | 4682 | 0100 | 05b2 | 0016 | 43be | 0100 | 03f2 | 0016 | 46be | 01ff | ffff | 0015 | bc7e | 0100 | 0501 | 0015 | e0c6 | 0100 | 0873 |
| 0352440 | 0016 | 46ce | 0100 | 04ef | 0016 | 46e6 | 01ff | ffff | 0016 | 474e | 0100 | 01de | 0016 | 475a | 0100 | 09b5 | 0015 | e21a | 0100 | 0b90 | 0016 | 45f2 | 0100 | 0404 |
| 0352520 | 0016 | 4786 | 0100 | 0480 | 0015 | bcca | 0100 | 0df7 | 0016 | 4796 | 0100 | 08ac | 0016 | 47a6 | 0100 | 0edc | 0015 | bcde | 0100 | 07fe | 0016 | 487e | 0100 | 0459 |
| 0352600 | 0016 | 48a2 | 0100 | 0822 | 0016 | 48ba | 0100 | 0eae | 0016 | 49b2 | 0100 | 0a60 | 0016 | 49e6 | 0100 | 0ed6 | 0016 | 49ee | 0100 | 0e21 | 0016 | 49fe | 0100 | 0c47 |
| 0352660 | 0016 | 4a06 | 0100 | 09ac | 0016 | 4a0e | 01ff | ffff | 0016 | 4a16 | 0100 | 0c5d | 0016 | 4a22 | 01ff | ffff | 0016 | 4a2e | 0100 | 0194 | 0016 | 4a3a | 0100 | 0e12 |
| 0352740 | 0016 | 4aa6 | 0100 | 0dc3 | 0016 | 4ab6 | 0100 | 043b | 0016 | 4b16 | 0100 | 0ebc | 0016 | 47fe | 0100 | 0a01 | 0015 | bd22 | 0100 | 0de1 | 0015 | bd5e | 0100 | 03a2 |
| 0353020 | 0016 | 4c0e | 0100 | 01e3 | 0015 | bd9a | 01ff | ffff | 0016 | 4c02 | 01ff | ffff | 0016 | 4bf6 | 0100 | 05ad | 0016 | 4806 | 0100 | 0bc3 | 0016 | 4746 | 0100 | 0142 |
| 0353100 | 0016 | 4c1a | 01ff | ffff | 0015 | bdca | 0100 | 0e38 | 0016 | 4c36 | 0100 | 0cf7 | 0015 | 63ae | 0100 | 0138 | 0016 | 496a | 0100 | 095d | 0016 | 4bea | 0100 | 067a |
| 0353160 | 0016 | 236a | 0100 | 0509 | 0016 | 23aa | 0100 | 0dcb | 0016 | 2486 | 0100 | 05b6 | 0016 | 24b6 | 0100 | 01d7 | 0016 | 24ea | 0100 | 0f04 | 0016 | 2526 | 0100 | 0f05 |
| 0353240 | 0015 | be56 | 0100 | 0213 | 0016 | 8cbe | 0100 | 0f08 | 0016 | 8cde | 0100 | 0fc9 | 0016 | 8d02 | 0100 | 08d9 | 0016 | 8d1a | 0100 | 0f0a | 0016 | 8d36 | 0100 | 0f0c |
| 0353320 | 0016 | 470e | 0100 | 0f0b | 0016 | b08e | 0100 | 06a0 | 0016 | b096 | 01ff | ffff | 0016 | b0a6 | 01ff | ffff | 0016 | b0b6 | 0100 | 01e6 | 0016 | b0ce | 01ff | ffff |
| 0353400 | 0016 | b352 | 0100 | 06e0 | 0016 | b37e | 0100 | 0bb2 | 0016 | b3aa | 0100 | 09a6 | 0016 | b402 | 0100 | 0e59 | 0016 | b45e | 0100 | 018e | 0016 | b1a2 | 0100 | 0815 |
| 0353460 | 0016 | 39ae | 01ff | ffff | 0016 | b54a | 0100 | 0915 | 0016 | b606 | 0100 | 0da9 | 0016 | b60e | 01ff | ffff | 0016 | b616 | 0100 | 0de0 | 0016 | b656 | 01ff | ffff |
| 0353540 | 0016 | b732 | 0100 | 0752 | 0016 | b792 | 01ff | ffff | 0016 | b7ca | 0100 | 0d9b | 0016 | b80a | 0100 | 0204 | 0016 | b83a | 0100 | 0806 | 0016 | b7fa | 0100 | 0e78 |
| 0353620 | 0016 | b8b2 | 0100 | 0880 | 0016 | b8e6 | 0100 | 0e18 | 0016 | b91a | 01ff | ffff | 0016 | b94e | 0100 | 0be1 | 0016 | b982 | 0100 | 0645 | 0016 | b992 | 01ff | ffff |
| 0353700 | 0016 | b9c2 | 0100 | 0e53 | 0016 | b9ee | 0100 | 01c6 | 0016 | ba22 | 01ff | ffff | 0016 | ba56 | 0100 | 0a70 | 0016 | ba8a | 0100 | 0cda | 0016 | babe | 01ff | ffff |
| 0353760 | 0016 | baf2 | 0100 | 06d3 | 0016 | bb2a | 0100 | 05da | 0016 | bb62 | 0100 | 0b81 | 0016 | bb9a | 01ff | ffff | 0016 | bbca | 01ff | ffff | 0016 | bbfe | 0100 | 08e1 |
| 0354040 | 0016 | bc2e | 0100 | 0e1a | 0016 | bc62 | 0100 | 0daa | 0016 | bc92 | 01ff | ffff | 0016 | bca2 | 01ff | ffff | 0016 | 41c6 | 0100 | 0f3a | 0016 | 420e | 0100 | 0f3c |
| 0354120 | 0016 | bdda | 0100 | 0e4e | 0016 | bd22 | 0100 | 0f07 | 0017 | 7f3a | 0100 | 0536 | 0016 | 6d0e | 0100 | 0f11 | 0016 | 6d4e | 01ff | ffff | 0017 | 7f22 | 01ff | ffff |
| 0354200 | 0016 | bdee | 0100 | 0c58 | 0017 | 9f6e | 0100 | 0e2f | 0017 | 7b2e | 0100 | 0382 | 0016 | 4a56 | 0100 | 0d83 | 0016 | b296 | 0100 | 0792 | 0017 | 7f16 | 01ff | ffff |
| 0354260 | 0016 | b22a | 01ff | ffff | 0016 | b116 | 0100 | 0723 | 0017 | 7f0a | 0100 | 020b | 0017 | 7efe | 01ff | ffff | 0017 | 7ef2 | 01ff | ffff | 0017 | a146 | 0100 | 0cc7 |
| 0354340 | 0016 | b7c2 | 01ff | ffff | 0017 | a156 | 0100 | 0f4f | 0017 | a17a | 0100 | 0d6c | 0017 | a182 | 01ff | ffff | 0017 | a192 | 01ff | ffff | 0016 | b4c2 | 01ff | ffff |

```
0354420 0017 a1c2 0100 0431 0016 b40e 01ff ffff 0017 a1f2 01ff ffff 0017 a232 0100 0f1c 0017 a27a 0100 0ef7 0017 7e9e 0100 07fb
0354500 0017 a28a 0100 0846 0016 3d9a 0100 08e5 0017 a29a 0100 0738 0017 a2d2 0100 07ad 0017 a2da 0100 0f53 0017 7e86 01ff ffff
0354560 0017 a2f2 0100 0f1f 0017 a2fa 0100 09e6 0017 a302 0100 0974 0016 b2b2 0100 0784 0017 a31a 0100 08c0 0017 a322 0100 04ec
0354640 0017 a332 0100 0b71 0016 b2a6 0100 0c8f 0017 7e56 0100 0b50 0017 a342 0100 0f13 0017 7e4a 0100 0604 0017 a34a 01ff ffff
0354720 0017 a352 0100 046b 0017 a35a 0100 0980 0017 a3aa 0100 0373 0017 a3e6 0100 0f70 0017 a3fa 0100 0f45 0017 a446 0100 0475
0355000 0017 a466 0100 0f46 0017 a48e 01ff ffff 0017 a4da 0100 0f75 0017 a502 01ff ffff 0017 a51a 0100 028f 0017 a52a 01ff ffff
0355060 0017 a55a 0100 04e5 0017 a5ae 0100 09d1 0017 a63a 01ff ffff 0017 a662 0100 0d7e 0017 a6a6 0100 00e8 0017 a6c6 0100 0baa
0355140 0017 a6fa 0100 0f7f 0017 a71a 0100 0f32 0017 a736 0100 082b 0017 a752 0100 0f82 0017 a4a6 0100 0f42 0017 a782 01ff ffff
0355220 0017 a0de 0100 073d 0017 a932 0100 0f27 0017 a376 0100 0ee9 0017 a112 0100 0d82 0017 a9d2 0100 0c36 0017 a9ea 0100 02c5
0355300 0017 a46e 01ff ffff 0017 aa8e 0100 0f8b 0017 aab6 01ff ffff 0017 a846 01ff ffff 0017 a83e 0100 0471 0017 aaca 01ff ffff
0355360 0016 b46a 0100 0e22 0016 b4ea 0100 0f16 0016 b63e 0100 0bbb 0017 aaea 0100 085a 0017 ab06 0100 0efd 0017 ab2e 0100 0e39
0355440 0017 ab56 0100 0f55 0016 b21a 01ff ffff 0017 ab66 0100 0f03 0017 a38e 01ff ffff 0016 4cca 01ff ffff 0016 4d06 0100 0d1c
0355520 0016 4d42 0100 0d24 0016 4d7e 0100 0bd3 0017 abb6 01ff ffff 0016 4e56 0100 0b36 0016 4e86 0100 0cd2 0016 4eba 0100 0fa1
0355600 0016 4ef6 0100 0fa2 0017 cbd2 0100 09e0 0016 b192 0100 0c3b 0017 edc2 0100 080d 0017 ee76 0100 0ab0 0017 ee8a 01ff ffff
0355660 0017 efa2 0100 0fa9 0017 f07e 0100 0fa8 0017 f156 0100 0f76 0017 f21a 0100 03e1 0017 f24a 0100 0fa4 0017 f4d2 0100 0410
0355740 0017 f4c6 0100 0882 0018 1536 0100 0f87 0017 f4ba 0100 0faf 0016 4fba 0100 0640 0018 15b2 0100 095f 0017 f2ca 0100 04ac
0356020 0017 f2ea 0100 069b 0018 15d6 0100 0fb5 0017 aeaa 0100 068c 0016 4bde 01ff ffff 0018 15ea 0100 0dbf 0017 af8e 01ff ffff
0356100 0017 f48a 0100 0480 0017 a7fa 0100 05bb 0017 f186 0100 085f 0017 f496 0100 0590 0017 cd72 0100 0f90 0018 1606 01ff ffff
0356160 0017 cdae 0100 0ed8 0017 eef6 01ff ffff 0017 f30e 01ff ffff 0018 165e 0100 03ef 0018 1676 0100 0bb5 0017 ac4e 01ff ffff
0356240 0017 ef4e 0100 0ab2 0017 efb2 0100 0f28 0017 f4de 0100 0dad 0017 f18e 0100 09cd 0017 a7ca 01ff ffff 0017 7f72 0100 0d68
0356320 0017 7fb2 0100 011d 0017 f306 0100 01d9 0017 f25a 01ff ffff 0018 17ee 0100 010e 0018 17e6 0100 03ce 0018 1826 0100 0f68
0356400 0018 1866 01ff ffff 0018 1886 0100 0dc2 0018 18a6 0100 048e 0018 18c6 0100 0c87 0018 18e6 0100 0eb4 0018 1906 0100 0539
0356460 0018 1926 0100 0d91 0018 1946 01ff ffff 0018 1966 0100 0466 0018 1986 0100 0291 0017 ee9e 0100 0b6f 0017 f516 0100 0840
0356540 0017 f552 0100 0d27 0018 1846 0100 0bd1 0018 39f6 0100 07c1 0018 3a3e 0100 0c9b 0018 3a96 0100 0fc6 0018 3ab2 0100 0bc8
0356620 0018 3ad6 0100 0bc9 0018 3b66 0100 0bd0 0017 f47e 0100 012c 0018 3c16 0100 0be8 0017 7f2e 01ff ffff 0018 3c46 0100 0731
0356700 0018 19d2 0100 0a4a 0018 1a12 0100 0f1e 0017 f2de 0100 0730 0018 1aee 01ff ffff 0018 1b1e 0100 0d87 0018 1b52 0100 0fef
0356760 0018 1b0e 0100 0ff0 0018 3a86 0100 093d 0018 3b86 01ff ffff 0018 7e3e 0100 0447 0018 7e1a 01ff ffff 0018 7e26 0100 0cdc
0357040 0018 7e36 01ff ffff 0018 7e46 0100 0d89 0019 7e56 0100 0ef2 0018 9f9a 0100 0fa7 0018 a5ba 01ff ffff 0018 a802 01ff ffff
0357120 0018 a986 0100 0edd 0018 a812 0100 0aff 0018 a5ca 0100 06b3 0018 a85a 0100 0905 0018 a71e 01ff ffff 0018 a342 01ff ffff
0357200 0018 ae9a 0100 0758 0018 add6 0100 0888 0018 af0e 0100 0f39 0018 a0b6 0100 0bdc 0018 adca 0100 0f22 0018 aa76 0100 0cd3
0357260 0018 b03e 0100 0a0e 0018 a0d6 0100 020c 0019 adb2 0100 0ec1 0018 ada6 0100 0d26 0018 b2de 0100 0c2f 0018 b38e 0100 0937
0357340 0018 b3be 0100 08a5 0018 b462 0100 045d 0018 b4c6 0100 0e20 0018 b50a 0100 0e60 0018 b55a 0100 0f50 0018 b56a 0100 0b67
0357420 0018 b646 0100 0ccf 0018 b68a 0100 0e50 0018 6736 0100 0d17 0018 b702 01ff ffff 0018 b712 0100 09c7 0018 b786 0100 0aad
0357500 0018 ad8e 01ff ffff 0018 ad82 0100 0fd1 0018 a7a6 0100 0dfa 0018 b796 0100 02ea 0018 b826 0100 0d3b 0018 b846 01ff ffff
0357560 0018 ad76 0100 0467 0018 b95a 0100 0106 0018 b9ba 01ff ffff 0018 ba66 0100 0f78 0018 ba86 0100 0a14 0018 ad46 0100 0c5f
0357640 0018 ad3a 01ff ffff 0018 ad2e 01ff ffff 0018 bb06 0100 0d9e 0018 bb3e 0100 0cea 0018 bbba 0100 066e 0018 a542 0100 0a89
0357720 0018 bbca 0100 07f1 0018 bd0a 0100 0fed 0018 3c8a 0100 08e7 0018 3cca 0100 0917 0018 bd1a 0100 0d6d 0018 3da2 0100 05e4
0360000 0018 3dde 0100 019e 0018 1aae 0100 0b42 0018 be32 0100 09c3 0019 1eee 0100 101a 0018 a6ce 0100 0a4b 0018 be0e 0100 0aee
0360060 0018 b4a6 0100 0b10 0019 1fe2 0100 0e8f 0018 b5d6 0100 0d1d 0018 be02 0100 0732 0019 2056 0100 085d 0018 ae02 0100 0fd8
0360140 0018 bb02 0100 0ba8 0018 b1ea 01ff ffff 0019 ad5e 01ff ffff 0018 bdde 0100 0d52 0018 b25a 0100 0c42 0018 bdd2 0100 103a
0360220 0018 aab2 0100 0f2b 0018 ad6a 0100 028b 0019 218a 0100 0ea4 0019 21e2 01ff ffff 0019 221e 01ff ffff 0019 2232 0100 06fb
0360300 0018 a5f2 0100 0ee2 0018 aaba 0100 0a9e 0019 2356 0100 07ea 0018 bdba 0100 0e9f 0019 2396 0100 0cae 0019 235e 0100 0fe6
0360360 0019 239e 0100 056e 0019 23a6 0100 0ff4 0018 bdae 0100 08a9 0019 23b6 0100 0f0d 0018 bda2 0100 02e2 0018 bd96 0100 0e63
0360440 0018 bd8a 0100 0f39 0019 247a 0100 0ec9 0018 b17e 01ff ffff 0019 234a 0100 08d8 0019 2516 01ff ffff 0019 2526 0100 089b
0360520 0019 252a 01ff ffff 0019 2566 01ff ffff 0019 256e 0100 08c7 0019 2576 0100 0a93 0019 2682 0100 0ff3 0018 bb66 0100 0fb7
0360600 0018 bd72 0100 0ef3 0019 2676 01ff ffff 0019 266a 0100 0d5e 0019 265e 0100 1003 0019 252e 0100 06b4 0019 2446 0100 1068
0360660 0019 2652 0100 03ea 0019 24d6 0100 0483 0019 2646 0100 106b 0019 2616 0100 07f6 0018 a4f2 0100 0ed1 0019 23c6 0100 0b11
0360740 0019 2316 0100 071b 0017 f466 01ff ffff 0018 acfe 01ff ffff 0019 22e6 01ff ffff 0019 28a2 0100 0a37 0018 3ea2 0100 102c
0361020 0019 28be 0100 0fe1 0018 adbe 0100 04e1 0018 a42a 0100 092d 0019 28f2 0100 03bc 0019 2912 0100 0ebf 0018 9fde 0100 0efa
0361100 0019 29c2 0100 1074 0019 29da 0100 107b 0019 29ee 0100 0dfe 0019 2a02 0100 0fba 0019 2a1a 0100 02f5 0018 b30e 0100 0a66
0361160 0019 2a2e 0100 107f 0019 2a4a 0100 0f1a 0019 2a62 0100 0dd0 0019 2b2e 0100 107c 0019 2b46 0100 0f35 0018 b416 0100 0be0
0361240 0019 2b5a 0100 0f73 0019 2b9a 01ff ffff 0018 edc2 01ff ffff 0019 2bb6 0100 1082 0019 2bd6 0100 108b 0019 2bee 0100 101f
0361320 0018 edee 01ff ffff 0018 b51a 01ff ffff 0019 2cb6 0100 1085 0019 2cce 0100 108f 0019 2ce2 0100 0fc5 0019 2cf6 0100 0190
0361400 0019 2d3a 0100 1079 0019 2d62 0100 0d79 0019 218a 0100 0169 0019 2e36 0100 1090 0019 2e4e 0100 0d30 0019 2e62 0100 0e8d
0361460 0019 2e76 0100 04f0 0019 2e96 0100 108c 0019 2eae 0100 0e3b 0018 f60e 0100 08bd 0019 2f52 0100 0ef9 0018 acc2 01ff ffff
```

```
0361540  0018 b6f2 0100 0d9a 0019 2f86 0100 0bd2 0018 a1e6 01ff ffff 000a 32ca 0100 0f3d 0018 ad9a 0100 1061 0019 2fca 0100 1076
0361620  0018 a38a 0100 09a1 0018 a126 0100 0edf 0019 2fd2 0100 04e4 0019 2fda 01ff ffff 0018 a936 01ff ffff 0019 3036 0100 0ec4
0361700  0018 b9ee 0100 0fdc 0014 4c5e 0100 0fc8 0018 be82 0100 1081 0018 bec2 0100 0a42 0018 bf06 0100 0f9f 0018 bf42 0100 0a6c
0361760  0018 b88a 0100 056d 0018 c016 0100 069a 0018 c04a 0100 0643 0018 c07e 0100 10b3 0018 c0ba 0100 10b4 0018 b746 01ff ffff
0362040  0018 b67a 01ff ffff 0018 b602 0100 045a 0018 b5be 0100 10b9 0019 70f2 0100 0fff 0019 710a 0100 10bb 0019 92da 0100 05f7
0362120  0019 3056 0100 10bc 0019 306a 0100 101b 0019 95fe 0100 10b6 0018 acda 01ff ffff 0018 bd36 01ff ffff 0018 b342 0100 037f
0362200  0018 acce 0100 0ffa 0019 978e 0100 08fd 0019 956a 01ff ffff 0018 be3e 0100 10af 0019 94aa 0100 09ce 0019 9796 0100 1037
0362260  0019 941a 0100 0811 0018 c17e 0100 0bfa 0019 97f2 0100 0bcf 0019 9472 0100 0922 0019 980e 0100 0991 0019 9832 01ff ffff
0362340  0019 939a 0100 10ac 0019 986a 0100 076e 0019 989a 0100 0f86 0019 940a 01ff ffff 0019 9322 0100 09ef 0019 98ba 0100 0d4d
0362420  0019 30b2 0100 0429 0019 98ee 0100 102a 0019 9902 0100 0ead 0019 98b2 0100 1007 0019 991e 0100 0b8c 0019 9936 0100 10da
0362500  0019 995e 0100 0d8d 0019 30be 0100 0d29 0018 a8de 0100 0d50 0019 984a 0100 1019 0019 997e 01ff ffff 0019 9986 0100 0ca7
0362560  0019 999e 0100 0b58 0019 99b6 0100 079e 0019 99ce 01ff ffff 0019 99ea 0100 10e1 0019 99fe 0100 0f8f 0019 5922 0100 10e6
0362640  0019 9a32 0100 0b37 0019 566e 0100 10e8 0019 5b0e 0100 09e2 0019 9a7e 0100 091b 0019 9a8e 0100 0a44 0019 9a9e 0100 0b62
0362720  0019 9ab2 0100 0fe3 0019 9ada 0100 0a58 0019 9af6 01ff ffff 0019 3082 01ff ffff 0019 9b0a 0100 04c1 0019 9b1a 0100 0b3e
0363000  0019 308e 0100 0a94 0019 309a 0100 1051 0019 9b42 0100 10a5 0019 9b5e 0100 10d4 0019 9b72 0100 08fc 0019 9b86 0100 0f84
0363060  0019 30ca 0100 0f57 0019 9bde 0100 0c97 0019 9c1e 0100 0fca 0019 9a76 0100 0762 0019 9a2a 0100 06fe 0018 ad22 0100 0ec5
0363140  0019 9e3a 0100 0c90 0019 9ca6 01ff ffff 0019 9e4e 0100 0fc1 0019 9e96 0100 10d2 0019 9eaa 0100 0f1b 0019 9ebe 01ff ffff
0363220  0019 9f42 01ff ffff 0019 9f5a 0100 1106 0019 9fbe 0100 0ae5 0019 a086 0100 10c7 0019 5a72 0100 0927 0019 c1fa 0100 110a
0363300  0019 a00e 0100 04a8 0019 9fce 0100 0935 0019 9f8e 0100 0ea1 0018 bfd6 0100 10ee 0019 332e 0100 110b 0019 a18e 01ff ffff
0363360  0019 9d96 01ff ffff 0019 a182 01ff ffff 0019 3046 0100 1015 0019 c382 0100 0df9 0019 c3ca 0100 0443 0019 c3ce 0100 0bc7
0363440  0019 c3d6 0100 04c5 0019 c3de 0100 0f5b 0019 c3e6 0100 0fd3 0019 c3ee 0100 05e5 0019 c41e 0100 02a5 0019 c42e 0100 0fe9
0363520  0019 c43e 0100 0930 0019 c4e6 0100 0e90 0019 a176 01ff ffff 0019 a10e 0100 0e68 0019 c4fe 01ff ffff 0019 c58e 0100 1121
0363600  0019 c5aa 0100 04e0 0019 c5c2 0100 0e55 0019 c5e2 0100 1077 0019 c6ca 0100 0ffc 0019 c732 0100 0ac4 0019 a16a 0100 0ed5
0363660  0019 c742 0100 0b1e 0019 c7aa 0100 07d0 0019 c7c2 0100 0409 0019 c91e 0100 0a5c 0019 c936 0100 1122 0019 c94e 0100 06c4
0363740  0019 ca8a 0100 112d 0019 93aa 0100 0bd8 0019 cb16 0100 0fe7 0019 a146 01ff ffff 0019 cc1e 01ff ffff 0019 a13a 0100 1011
0364020  0019 cc76 0100 0931 0019 cd66 01ff ffff 0019 ce2e 0100 1125 0019 ce42 0100 0d34 0019 ce5a 01ff ffff 0019 ceee 0100 04ed
0364100  0019 cf06 0100 0cd6 0019 cf8e 0100 0a53 0019 cf96 0100 10b0 0019 cf9e 0100 063d 0019 cfa6 0100 00f6 0019 cfae 01ff ffff
0364160  0019 d09a 0100 113a 0019 d13a 0100 0626 0019 d156 0100 09f8 0019 d006 0100 0f15 0019 d212 0100 1126 0019 d226 0100 1146
0364240  0019 d302 0100 1045 0019 3a92 0100 112e 0019 d386 0100 1142 0019 d3a6 0100 114a 0019 d4ee 0100 109f 0019 d7b6 0100 110c
0364320  0019 d52e 01ff ffff 0019 72e6 0100 1123 0019 7326 0100 02b6 0019 cb8a 0100 0f40 0019 cb82 0100 0fd4 0019 cffe 01ff ffff
0364400  0019 d482 0100 1150 0019 c836 01ff ffff 0019 d7ee 0100 1013 0019 d82a 01ff ffff 001a 3c36 0100 0d69 0019 d762 0100 074b
0364460  0019 d756 0100 06b1 001a 3bca 0100 113e 001a 416e 0100 0a30 0019 d8c2 0100 0dec 0019 f83e 0100 115d 0019 f886 0100 06b0
0364540  0019 d562 0100 1043 001a 417e 0100 113f 001a 425a 0100 0461 001a 4266 01ff ffff 001a 426e 0100 10fe 001a 4282 0100 0f94
0364620  001a 428a 0100 104b 001a 429e 0100 0c76 001a 42a6 0100 05cc 001a 42ba 0100 0db7 001a 42ce 01ff ffff 001a 42e2 0100 0fb9
0364700  001a 42f6 0100 0ed3 001a 430a 0100 045c 001a 431e 01ff ffff 0019 c89a 0100 115f 001a 3f7e 0100 0f25 001a 43ae 0100 0fc3
0364760  001a 436a 01ff ffff 001a 3f0a 01ff ffff 001a 4376 0100 0e77 001a 4396 0100 0ebd 0019 ce76 0100 0eab 001a 44c2 0100 0e62
0365040  001a 45a6 01ff ffff 001a 45ba 0100 10aa 001a 460e 0100 1166 001a 462a 0100 0d8f 0019 c9fa 0100 0fc9 001a 46f2 0100 1027
0365120  001a 473a 01ff ffff 0019 a152 01ff ffff 001a 4846 0100 10a7 001a 3da6 0100 0a84 000a 2a8e 0100 1181 0000 0000 0000 0000
0365200  0000 0000 0000 0000 0000 0000 0000 0000 0000 0000 0000 0000 0000 0000 0000 0000 0000 0000 0000 0000 0000 0000 0000 0000
*
0457140  0000 00db 0000 106d 0000 0a19 0000 0bc6 0000 017a 0000 07d9 0000 0e51 ffff ffff ffff ffff ffff ffff ffff ffff ffff ffff
0457220  0000 109c 0000 0596 0000 0a9a ffff ffff ffff ffff 0000 0669 ffff ffff 0000 04d5 ffff ffff 0000 0a33 0000 033a 0000 071a
0457300  0000 04f2 0000 0700 0000 0d0b 0000 077c 0000 0959 ffff ffff ffff ffff 0000 09f3 0000 0beb 0000 0107 0000 1096 0000 0f81
0457360  0000 0115 0000 08cb 0000 101e 0000 0aa5 0000 0141 0000 014f 0000 0150 0000 10fb 0000 075e 0000 0869 0000 0f80 0000 0167
0457440  0000 092c ffff ffff 0000 081c ffff ffff 0000 0e47 0000 0a87 0000 0e00 ffff ffff 0000 086e ffff ffff 0000 0e66 0000 01bb
0457520  0000 10f7 0000 0e3d 0000 0dfb 0000 0b28 0000 04d1 0000 0e1f ffff ffff 0000 0393 0000 10ff ffff ffff 0000 1056 0000 0a1a
0457600  0000 0a92 0000 0f2f ffff ffff 0000 0ec7 0000 0124 0000 063c 0000 1040 0000 1029 ffff ffff 0000 02fc 0000 02f9 0000 0b7c
0457660  ffff ffff 0000 0aa9 ffff ffff 0000 0938 0000 0e10 0000 0c79 ffff ffff 0000 02ce 0000 0b2c 0000 0823 0000 1039 0000 0ff8
0457740  0000 0460 0000 0fdf 0000 0aaa 0000 03d3 0000 0fb2 0000 0b53 0000 043c ffff ffff 0000 0d3e 0000 0e6c ffff ffff 0000 011f
0460020  0000 09fb 0000 0feb 0000 105b 0000 0aab 0000 0c62 0000 092b 0000 0598 0000 105d 0000 0c8c 0000 1116 0000 0659 0000 105e
0460100  0000 0aac 0000 116e 0000 0dc0 0000 067e 0000 0a88 0000 0685 0000 043a 0000 0c86 ffff ffff 0000 065e ffff ffff 0000 0f48
0460160  ffff ffff ffff ffff ffff ffff 0000 10be 0000 0d6e 0000 0f06 0000 0e5e 0000 08b4 0000 0b64 0000 10d9 0000 0ca8 0000 0e28
0460240  ffff ffff 0000 02d4 0000 0857 ffff ffff 0000 07bb 0000 1069 ffff ffff 0000 105c 0000 015c 0000 08a4 0000 0d40 0000 0a96
0460320  0000 10cf ffff ffff ffff ffff 0000 09fc 0000 106f 0000 0dc7 0000 0e7b 0000 0c1f 0000 03fe 0000 0f5f 0000 0a34 ffff ffff
0460400  ffff ffff ffff ffff 0000 0ab6 0000 0dd2 0000 0417 0000 0f23 0000 0d5c 0000 1137 ffff ffff 0000 0f0e 0000 0d01 0000 0858
```

| | | | | | | | | | | | | | | | | | | | | | | | | |
|---|---|---|---|---|---|---|---|---|---|---|---|---|---|---|---|---|---|---|---|---|---|---|---|---|
| 0460460 | 0000 | 0d90 | 0000 | 0bf9 | 0000 | 0d39 | 0000 | 0cc9 | 0000 | 0a95 | 0000 | 10d7 | 0000 | 0f2d | ffff | ffff | 0000 | 0392 | ffff | ffff | 0000 | 01cc | 0000 | 0162 |
| 0460540 | 0000 | 05c9 | 0000 | 10dc | 0000 | 09db | 0000 | 0cf0 | 0000 | 0d1e | 0000 | 0943 | 0000 | 014c | ffff | ffff | 0000 | 06da | 0000 | 0cd3 | 0000 | 0c4d | 0000 | 0d96 |
| 0460620 | 0000 | 0e94 | 0000 | 0442 | 0000 | 10ed | 0000 | 0df1 | 0000 | 0c71 | 0000 | 09f0 | ffff | ffff | 0000 | 0721 | 0000 | 0193 | 0000 | 080c | ffff | ffff | 0000 | 0710 |
| 0460700 | 0000 | 0abe | 0000 | 1128 | 0000 | 0e07 | 0000 | 0d66 | 0000 | 1062 | 0000 | 0c29 | 0000 | 0df3 | 0000 | 0bca | ffff | ffff | 0000 | 0e34 | 0000 | 0fb8 | 0000 | 02ef |
| 0460760 | 0000 | 0e8c | 0000 | 04ae | 0000 | 0f0f | 0000 | 02f0 | 0000 | 0e95 | 0000 | 0f36 | 0000 | 031c | 0000 | 0786 | 0000 | 0fe5 | 0000 | 1008 | 0000 | 0b6c | 0000 | 0d20 |
| 0461040 | 0000 | 058c | 0000 | 0f58 | 0000 | 0dc5 | 0000 | 089c | 0000 | 0ff2 | 0000 | 0944 | 0000 | 1083 | ffff | ffff | 0000 | 08fe | ffff | ffff | ffff | ffff | 0000 | 0846 |
| 0461120 | 0000 | 0e9b | ffff | ffff | 0000 | 115e | 0000 | 0702 | 0000 | 082e | 0000 | 0c7e | ffff | ffff | 0000 | 0394 | 0000 | 0a4f | 0000 | 1026 | ffff | ffff | 0000 | 0b1f |
| 0461200 | 0000 | 0dbd | 0000 | 0ef8 | 0000 | 078c | ffff | ffff | 0000 | 0c60 | 0000 | 110f | 0000 | 0d7f | 0000 | 1153 | 0000 | 081e | 0000 | 08f6 | ffff | ffff | 0000 | 0e1c |
| 0461260 | 0000 | 07a8 | 0000 | 039a | 0000 | 06c1 | ffff | ffff | 0000 | 0681 | 0000 | 0c3c | 0000 | 00ff | 0000 | 116c | 0000 | 116b | 0000 | 116a | 0000 | 1169 | 0000 | 1167 |
| 0461340 | 0000 | 1165 | 0000 | 0dca | 0000 | 097e | 0000 | 097f | 0000 | 10de | ffff | ffff | ffff | ffff | 0000 | 0e71 | 0000 | 036b | 0000 | 06fc | 0000 | 05fa | ffff | ffff |
| 0461420 | 0000 | 0eee | 0000 | 09a1 | 0000 | 0424 | 0000 | 0a08 | ffff | ffff | 0000 | 046a | 0000 | 0872 | 0000 | 1148 | 0000 | 0f00 | 0000 | 10ca | 0000 | 0c37 | ffff | ffff |
| 0461500 | 0000 | 0fd6 | 0000 | 0f47 | ffff | ffff | 0000 | 10df | 0000 | 0fcc | 0000 | 04ad | 0000 | 0f66 | ffff | ffff | 0000 | 1117 | 0000 | 1131 | 0000 | 097d | 0000 | 0d3c |
| 0461560 | 0000 | 0a61 | 0000 | 0f95 | 0000 | 0ec0 | 0000 | 0a9f | 0000 | 0bd1 | 0000 | 100c | 0000 | 0a2f | 0000 | 0bd4 | 0000 | 0554 | 0000 | 105a | 0000 | 0cb6 | 0000 | 0eef |
| 0461640 | 0000 | 0a62 | 0000 | 0185 | 0000 | 0865 | 0000 | 092a | 0000 | 0899 | ffff | ffff | 0000 | 0677 | 0000 | 0a72 | 0000 | 067b | 0000 | 0cee | 0000 | 105f | 0000 | 1118 |
| 0461720 | 0000 | 1034 | ffff | ffff | 0000 | 087c | 0000 | 07b7 | 0000 | 0f6f | 0000 | 111b | 0000 | 108e | ffff | ffff | 0000 | 0f5a | 0000 | 0c7a | 0000 | 06b5 | 0000 | 0610 |
| 0462000 | 0000 | 1057 | 0000 | 071e | ffff | ffff | 0000 | 10bf | 0000 | 10fd | ffff | ffff | 0000 | 0cd8 | 0000 | 0c33 | 0000 | 0bae | 0000 | 0a9a | 0000 | 0f8d | 0000 | 067f |
| 0462060 | 0000 | 0ef5 | 0000 | 0fb3 | ffff | ffff | 0000 | 039b | 0000 | 08c2 | ffff | ffff | 0000 | 109b | ffff | ffff | 0000 | 0f9d | 0000 | 0817 | 0000 | 034f | 0000 | 086a |
| 0462140 | 0000 | 06c3 | 0000 | 0e45 | 0000 | 1084 | ffff | ffff | 0000 | 0709 | 0000 | 062c | ffff | ffff | 0000 | 0b2f | 0000 | 0e4c | 0000 | 1136 | 0000 | 07d7 | ffff | ffff |
| 0462220 | 0000 | 0e31 | 0000 | 1035 | 0000 | 0cd7 | 0000 | 0742 | 0000 | 04b4 | 0000 | 0d88 | ffff | ffff | 0000 | 0dce | 0000 | 0ab7 | 0000 | 102b | 0000 | 0633 | ffff | ffff |
| 0462300 | 0000 | 0667 | ffff | ffff | 0000 | 0c2b | 0000 | 1023 | 0000 | 0a2b | 0000 | 1020 | ffff | ffff | 0000 | 112b | 0000 | 0c68 | 0000 | 083a | 0000 | 03a1 | ffff | ffff |
| 0462360 | 0000 | 0c1c | 0000 | 0eec | 0000 | 069c | ffff | ffff | ffff | ffff | 0000 | 0ca1 | 0000 | 02e6 | 0000 | 0fac | 0000 | 0e8e | 0000 | 06bb | 0000 | 0d92 | 0000 | 0eb7 |
| 0462440 | ffff | ffff | 0000 | 0838 | 0000 | 0f2a | 0000 | 1091 | 0000 | 073f | 0000 | 0f89 | 0000 | 047e | 0000 | 0cbf | 0000 | 059e | 0000 | 0c70 | ffff | ffff | 0000 | 0c85 |
| 0462520 | 0000 | 0fce | 0000 | 040d | 0000 | 0f60 | 0000 | 0360 | 0000 | 0e54 | 0000 | 03b4 | 0000 | 038f | 0000 | 0d0e | 0000 | 0f43 | 0000 | 100a | 0000 | 0836 | ffff | ffff |
| 0462600 | 0000 | 055b | ffff | ffff | ffff | ffff | 0000 | 0dd4 | 0000 | 10c6 | 0000 | 0897 | 0000 | 1144 | 0000 | 1005 | 0000 | 0fe8 | 0000 | 0e97 | 0000 | 02da | 0000 | 084e |
| 0462660 | 0000 | 0a40 | 0000 | 0f37 | 0000 | 0f5d | 0000 | 096c | 0000 | 09b4 | 0000 | 0ecc | 0000 | 0e2c | 0000 | 0f3e | 0000 | 0b89 | 0000 | 0493 | 0000 | 0d81 | ffff | ffff |
| 0462740 | 0000 | 07d4 | 0000 | 0e98 | 0000 | 0134 | 0000 | 05c8 | 0000 | 0eff | 0000 | 0132 | 0000 | 0e3e | 0000 | 0911 | 0000 | 0830 | 0000 | 0e99 | ffff | ffff | 0000 | 0755 |
| 0463020 | 0000 | 10c9 | 0000 | 1054 | 0000 | 08b9 | 0000 | 015e | 0000 | 0977 | 0000 | 0964 | ffff | ffff | ffff | ffff | 0000 | 116f | 0000 | 0a2c | 0000 | 00fd | 0000 | 0a16 |
| 0463100 | ffff | ffff | 0000 | 09b1 | ffff | ffff | ffff | ffff | 0000 | 0bee | 0000 | 080a | 0000 | 0b91 | 0000 | 111d | 0000 | 034a | 0000 | 0ccc | ffff | ffff | 0000 | 0ee4 |
| 0463160 | 0000 | 0a2e | 0000 | 0f4d | 0000 | 0f6b | 0000 | 0dcc | 0000 | 0f6e | 0000 | 02c7 | ffff | ffff | 0000 | 09b6 | 0000 | 0e19 | 0000 | 02e9 | 0000 | 0c2e | 0000 | 1149 |
| 0463240 | 0000 | 0e6a | 0000 | 0891 | ffff | ffff | 0000 | 0893 | ffff | ffff | 0000 | 08dc | ffff | ffff | 0000 | 0de4 | 0000 | 0fcf | 0000 | 0954 | 0000 | 0fd0 | 0000 | 101d |
| 0463320 | 0000 | 0f63 | 0000 | 04fe | 0000 | 099e | ffff | ffff | ffff | ffff | 0000 | 0f88 | 0000 | 0682 | 0000 | 0f83 | 0000 | 0def | 0000 | 1006 | 0000 | 1012 | 0000 | 0842 |
| 0463400 | 0000 | 0f2c | ffff | ffff | 0000 | 0e72 | 0000 | 082f | 0000 | 0a7e | 0000 | 0f21 | 0000 | 1009 | 0000 | 08d1 | 0000 | 0ce1 | 0000 | 0128 | 0000 | 091f | 0000 | 0f7d |
| 0463460 | 0000 | 00ee | 0000 | 0a36 | 0000 | 0697 | 0000 | 0a52 | 0000 | 04f1 | 0000 | 0c93 | 0000 | 055e | 0000 | 113c | 0000 | 111f | ffff | ffff | 0000 | 0e1e | ffff | ffff |
| 0463540 | 0000 | 053c | 0000 | 0348 | 0000 | 0fbb | 0000 | 10ea | 0000 | 0d03 | ffff | ffff | 0000 | 0fb6 | 0000 | 0c1e | ffff | ffff | 0000 | 083c | 0000 | 0f91 | 0000 | 0bd5 |
| 0463620 | 0000 | 0eda | 0000 | 05f1 | 0000 | 03e9 | 0000 | 05ff | ffff | ffff | 0000 | 0c53 | 0000 | 0e4a | 0000 | 0f5e | 0000 | 0e35 | 0000 | 07dd | 0000 | 109e | 0000 | 07ec |
| 0463700 | ffff | ffff | 0000 | 0d0c | 0000 | 10e3 | ffff | ffff | 0000 | 0fe4 | 0000 | 06e9 | 0000 | 104a | 0000 | 08a3 | ffff | ffff | 0000 | 0f44 | 0000 | 0f33 | 0000 | 10db |
| 0463760 | ffff | ffff | 0000 | 0fe2 | 0000 | 0ff5 | 0000 | 0ff6 | 0000 | 0e89 | 0000 | 0c75 | 0000 | 0e58 | 0000 | 0cba | 0000 | 0c98 | 0000 | 0f20 | 0000 | 08be | 0000 | 0d05 |
| 0464040 | 0000 | 07dc | 0000 | 08d4 | 0000 | 079a | 0000 | 0c67 | 0000 | 0bf1 | 0000 | 0d42 | 0000 | 0f52 | 0000 | 10fc | 0000 | 0e37 | ffff | ffff | 0000 | 0552 | 0000 | 114e |
| 0464120 | 0000 | 0b5a | 0000 | 0f4a | 0000 | 06f5 | 0000 | 0da2 | ffff | ffff | 0000 | 1174 | 0000 | 1171 | 0000 | 0e41 | 0000 | 0c50 | 0000 | 03e5 | 0000 | 06ab | 0000 | 1052 |
| 0464200 | 0000 | 0eed | 0000 | 10a6 | ffff | ffff | 0000 | 0dcd | 0000 | 0ac2 | 0000 | 0ec6 | 0000 | 0d98 | 0000 | 08d3 | 0000 | 09d5 | 0000 | 022d | 0000 | 0e69 | 0000 | 0a03 |
| 0464260 | 0000 | 10d0 | 0000 | 0fdd | 0000 | 029a | 0000 | 1050 | 0000 | 02a4 | 0000 | 111c | 0000 | 02ae | 0000 | 02a7 | 0000 | 0e8a | 0000 | 0e2d | 0000 | 02aa | 0000 | 02ab |
| 0464340 | 0000 | 02ac | 0000 | 04dc | 0000 | 0286 | 0000 | 0fd9 | 0000 | 07e1 | 0000 | 0289 | 0000 | 0a07 | 0000 | 1047 | 0000 | 0b38 | 0000 | 028d | 0000 | 028e | 0000 | 1025 |
| 0464420 | 0000 | 100e | 0000 | 0444 | 0000 | 0b3d | 0000 | 1028 | 0000 | 0f5c | 0000 | 1151 | 0000 | 1152 | 0000 | 0fd5 | ffff | ffff | ffff | ffff | 0000 | 10e9 | 0000 | 09cc |
| 0464500 | 0000 | 0ee3 | ffff | ffff | 0000 | 0883 | 0000 | 0979 | 0000 | 071b | 0000 | 0d95 | 0000 | 0d99 | 0000 | 0da7 | 0000 | 10ef | 0000 | 1160 | 0000 | 0ecb | 0000 | 1018 |
| 0464560 | 0000 | 0a45 | 0000 | 0e0d | ffff | ffff | 0000 | 01f7 | 0000 | 06c7 | 0000 | 0c14 | ffff | ffff | 0000 | 0d8e | ffff | ffff | ffff | ffff | 0000 | 111a | 0000 | 1119 |
| 0464640 | 0000 | 0425 | 0000 | 0f2e | 0000 | 0fda | 0000 | 0fdb | 0000 | 0a55 | ffff | ffff | 0000 | 0d8c | 0000 | 0e06 | 0000 | 0f69 | 0000 | 039e | 0000 | 05a9 | ffff | ffff |
| 0464720 | 0000 | 0e83 | 0000 | 0ca2 | 0000 | 0eea | 0000 | 0f4b | 0000 | 0e8b | 0000 | 117d | ffff | ffff | 0000 | 0f34 | 0000 | 114d | 0000 | 0c49 | 0000 | 1064 | 0000 | 0f9b |
| 0465000 | 0000 | 0a90 | ffff | ffff | 0000 | 0e24 | 0000 | 1041 | 0000 | 07e5 | 0000 | 0761 | 0000 | 098e | 0000 | 10a3 | ffff | ffff | 0000 | 0fd2 | 0000 | 0a3b | 0000 | 06d1 |
| 0465060 | 0000 | 0df8 | 0000 | 10a8 | 0000 | 0ee7 | 0000 | 0fcd | 0000 | 0eeb | 0000 | 0ec2 | 0000 | 0b20 | 0000 | 05c0 | 0000 | 0d00 | ffff | ffff | 0000 | 0ab8 | 0000 | 0be6 |
| 0465140 | 0000 | 0989 | 0000 | 0f29 | 0000 | 062e | 0000 | 0dbc | 0000 | 1180 | ffff | ffff | ffff | ffff | 0000 | 0b03 | 0000 | 0a5f | 0000 | 079d | 0000 | 06e4 | ffff | ffff |
| 0465220 | 0000 | 0f9a | 0000 | 1058 | 0000 | 0b73 | 0000 | 082d | 0000 | 05d3 | 0000 | 0618 | 0000 | 0a00 | ffff | ffff | 0000 | 05c6 | 0000 | 0975 | 0000 | 0daf | ffff | ffff |
| 0465300 | 0000 | 0466 | 0000 | 0a8f | 0000 | 0efe | 0000 | 0f59 | 0000 | 10ad | 0000 | 030a | 0000 | 0620 | 0000 | 0a77 | 0000 | 06fd | 0000 | 0f01 | 0000 | 0542 | 0000 | 0e33 |
| 0465360 | 0000 | 10b1 | 0000 | 0679 | 0000 | 0d48 | ffff | ffff | 0000 | 0ddb | 0000 | 0c17 | 0000 | 0ade | 0000 | 0fab | 0000 | 0d47 | 0000 | 09a0 | ffff | ffff | 0000 | 09ec |
| 0465440 | 0000 | 0a7b | 0000 | 09ee | 0000 | 0ee8 | ffff | ffff | ffff | ffff | 0000 | 10cb | ffff | ffff | ffff | ffff | ffff | ffff | 0000 | 088e | ffff | ffff | 0000 | 1179 |
| 0465520 | 0000 | 054a | 0000 | 043f | 0000 | 0e6b | ffff | ffff | ffff | ffff | ffff | ffff | ffff | ffff | 0000 | 096a | 0000 | 1100 | 0000 | 0dc4 | 0000 | 052e | ffff | ffff |

| | | | | | | | | | | | | | | | | | | | | | | | | |
|---|---|---|---|---|---|---|---|---|---|---|---|---|---|---|---|---|---|---|---|---|---|---|---|---|
| 0465600 | 0000 | 0b4e | ffff | ffff | 0000 | 0b74 | 0000 | 0a63 | 0000 | 0123 | ffff | ffff | 0000 | 09f6 | 0000 | 0e2b | ffff | ffff | ffff | ffff | 0000 | 09aa | 0000 | 10e7 |
| 0465660 | 0000 | 0e67 | 0000 | 05db | 0000 | 0a6d | ffff | ffff | 0000 | 013c | 0000 | 0d15 | ffff | ffff | 0000 | 1041 | 0000 | 0e79 | ffff | ffff | 0000 | 0fc0 | 0000 | 052c |
| 0465740 | 0000 | 0469 | ffff | ffff | 0000 | 050b | 0000 | 0e2e | 0000 | 0f72 | 0000 | 0e30 | ffff | ffff | ffff | ffff | 0000 | 0450 | 0000 | 103d | 0000 | 07b2 | 0000 | 0de7 |
| 0466020 | 0000 | 09c8 | 0000 | 0852 | 0000 | 0e92 | 0000 | 0dab | 0000 | 0f98 | ffff | ffff | 0000 | 1129 | 0000 | 1159 | 0000 | 0f18 | 0000 | 07b1 | 0000 | 115a | 0000 | 0528 |
| 0466100 | 0000 | 081b | 0000 | 0c95 | ffff | ffff | 0000 | 0a38 | 0000 | 1031 | 0000 | 0ef0 | 0000 | 06e3 | ffff | ffff | 0000 | 081f | 0000 | 1134 | ffff | ffff | 0000 | 0e44 |
| 0466160 | 0000 | 0777 | 0000 | 0db4 | 0000 | 10e0 | 0000 | 0c21 | 0000 | 103b | ffff | ffff | 0000 | 0fb0 | 0000 | 04a4 | 0000 | 0648 | ffff | ffff | 0000 | 1095 | 0000 | 0724 |
| 0466240 | 0000 | 0e61 | 0000 | 1078 | 0000 | 0eb6 | 0000 | 117c | 0000 | 1093 | ffff | ffff | 0000 | 0e7f | ffff | ffff | 0000 | 0e03 | ffff | ffff | 0000 | 0c48 | 0000 | 0618 |
| 0466320 | 0000 | 00fe | 0000 | 0d78 | ffff | ffff | 0000 | 111e | 0000 | 08a7 | 0000 | 032d | 0000 | 10c1 | 0000 | 10b5 | 0000 | 0d65 | ffff | ffff | ffff | ffff | 0000 | 075b |
| 0466400 | 0000 | 0e57 | 0000 | 1002 | 0000 | 08c1 | 0000 | 0f77 | 0000 | 0353 | 0000 | 0ca6 | 0000 | 0f51 | 0000 | 1175 | 0000 | 0ce0 | 0000 | 0f41 | 0000 | 0f31 | 0000 | 10d6 |
| 0466460 | 0000 | 0b0d | 0000 | 01b0 | 0000 | 0f54 | 0000 | 0f65 | 0000 | 0348 | ffff | ffff | 0000 | 01b3 | 0000 | 0c6d | 0000 | 1182 | 0000 | 03f6 | 0000 | 1042 | ffff | ffff |
| 0466540 | 0000 | 0e7c | 0000 | 0128 | 0000 | 0bcb | 0000 | 0735 | 0000 | 1108 | ffff | ffff | 0000 | 0ef1 | 0000 | 0909 | 0000 | 0eb1 | ffff | ffff | 0000 | 0924 | 0000 | 0916 |
| 0466620 | 0000 | 1053 | 0000 | 064a | 0000 | 0b55 | ffff | ffff | 0000 | 1114 | 0000 | 0e9c | ffff | ffff | 0000 | 10f0 | 0000 | 0e3f | 0000 | 106e | 0000 | 08b8 | 0000 | 02ff |
| 0466700 | 0000 | 086f | 0000 | 0e9e | 0000 | 0ced | 0000 | 1158 | 0000 | 10a0 | 0000 | 104f | 0000 | 0aec | 0000 | 0fbd | 0000 | 0f97 | 0000 | 0ea0 | 0000 | 09ad | 0000 | 059f |
| 0466760 | 0000 | 0edb | 0000 | 110e | 0000 | 06a4 | 0000 | 0fbf | 0000 | 08f3 | 0000 | 0ea2 | 0000 | 0dbe | 0000 | 1033 | 0000 | 0e87 | 0000 | 0ea3 | 0000 | 0bd9 | ffff | ffff |
| 0467040 | 0000 | 06a1 | 0000 | 02fe | 0000 | 079b | 0000 | 079c | 0000 | 03c4 | ffff | ffff | ffff | ffff | 0000 | 0fcb | 0000 | 08b3 | 0000 | 033b | 0000 | 1102 | ffff | ffff |
| 0467120 | 0000 | 1099 | ffff | ffff | 0000 | 0b92 | 0000 | 01e7 | 0000 | 05f2 | 0000 | 106a | 0000 | 0a18 | 0000 | 0841 | 0000 | 0e96 | 0000 | 0fc2 | ffff | ffff | ffff | ffff |
| 0467200 | 0000 | 1094 | 0000 | 03ae | 0000 | 08b0 | 0000 | 0fc4 | 0000 | 0fea | 0000 | 1016 | 0000 | 0f6a | ffff | ffff | ffff | ffff | 0000 | 0489 | 0000 | 0c3e | ffff | ffff |
| 0467260 | 0000 | 016c | 0000 | 0763 | ffff | ffff | 0000 | 0a8d | 0000 | 0136 | 0000 | 0144 | 0000 | 06de | 0000 | 08bc | 0000 | 0ffb | ffff | ffff | 0000 | 0aae | ffff | ffff |
| 0467340 | 0000 | 09e1 | 0000 | 0f02 | 0000 | 03af | 0000 | 0dea | 0000 | 0a49 | ffff | ffff | 0000 | 0e84 | 0000 | 0968 | ffff | ffff | ffff | ffff | 0000 | 0603 | 0000 | 0faa |
| 0467420 | ffff | ffff | 0000 | 06dd | 0000 | 0af4 | 0000 | 0360 | 0000 | 1014 | 0000 | 04da | 0000 | 0c96 | 0000 | 0e76 | 0000 | 0d55 | 0000 | 0525 | 0000 | 0a38 | ffff | ffff |
| 0467500 | 0000 | 0ac8 | 0000 | 0352 | 0000 | 0a0c | 0000 | 0cd4 | 0000 | 09d9 | ffff | ffff | ffff | ffff | 0000 | 0570 | 0000 | 10bd | 0000 | 07bf | 0000 | 0e70 | 0000 | 0add |
| 0467560 | 0000 | 0c88 | 0000 | 0a13 | 0000 | 108d | ffff | ffff | 0000 | 03e2 | 0000 | 10ec | ffff | ffff | 0000 | 1177 | 0000 | 0397 | 0000 | 03c5 | 0000 | 0b83 | ffff | ffff |
| 0467640 | ffff | ffff | 0000 | 0e23 | 0000 | 0ed7 | 0000 | 0dd1 | 0000 | 0a6a | 0000 | 05fd | 0000 | 06b2 | 0000 | 0ce7 | 0000 | 07ac | ffff | ffff | 0000 | 10e5 | 0000 | 08ae |
| 0467720 | 0000 | 1087 | ffff | ffff | 0000 | 0c13 | 0000 | 0ff7 | 0000 | 0e91 | 0000 | 0a8c | 0000 | 0e82 | 0000 | 0c32 | 0000 | 0972 | 0000 | 0939 | 0000 | 0f64 | 0000 | 0977 |
| 0470000 | 0000 | 0ce5 | 0000 | 0715 | 0000 | 041b | ffff | ffff | 0000 | 021c | 0000 | 0fec | 0000 | 0f30 | ffff | ffff | ffff | ffff | 0000 | 03cb | ffff | ffff | ffff | ffff |
| 0470060 | 0000 | 0d5a | 0000 | 063f | 0000 | 116d | 0000 | 0563 | 0000 | 0e6d | 0000 | 02ba | 0000 | 0e6f | 0000 | 09b3 | 0000 | 08ec | 0000 | 0f3b | ffff | ffff | ffff | ffff |
| 0470140 | ffff | ffff | 0000 | 1147 | 0000 | 0d5f | ffff | ffff | 0000 | 0f9e | 0000 | 058b | 0000 | 0726 | 0000 | 0223 | 0000 | 10ba | 0000 | 1055 | 0000 | 09a9 | 0000 | 0de8 |
| 0470220 | 0000 | 0d9f | 0000 | 0cb5 | 0000 | 0d57 | 0000 | 0bff | 0000 | 09df | 0000 | 06f8 | 0000 | 0cb9 | 0000 | 0f62 | 0000 | 0a41 | 0000 | 08d0 | 0000 | 0fa0 | 0000 | 0dd7 |
| 0470300 | 0000 | 0639 | ffff | ffff | ffff | ffff | 0000 | 0e26 | 0000 | 0747 | ffff | ffff | ffff | ffff | 0000 | 0f8e | 0000 | 0457 | 0000 | 03a6 | 0000 | 068f | 0000 | 0abf |
| 0470360 | 0000 | 0a32 | ffff | ffff | 0000 | 0f93 | 0000 | 0e4f | 0000 | 0703 | 0000 | 0c22 | 0000 | 0126 | 0000 | 0143 | 0000 | 0e40 | ffff | ffff | 0000 | 0b4b | 0000 | 0c56 |
| 0470440 | 0000 | 1156 | 0000 | 04ce | 0000 | 1070 | 0000 | 0739 | 0000 | 0e51 | 0000 | 02dd | 0000 | 0ee1 | 0000 | 0f67 | 0000 | 08b1 | 0000 | 0d02 | 0000 | 04c6 | ffff | ffff |
| 0470520 | 0000 | 0f14 | 0000 | 0a0f | 0000 | 0cdb | 0000 | 0323 | ffff | ffff | 0000 | 10dd | 0000 | 0f6d | 0000 | 1073 | 0000 | 0d16 | 0000 | 059a | ffff | ffff | 0000 | 0af0 |
| 0470600 | 0000 | 0f17 | 0000 | 1072 | 0000 | 0451 | 0000 | 0d97 | 0000 | 1043 | 0000 | 0517 | 0000 | 0b77 | 0000 | 0d21 | ffff | ffff | 0000 | 0f7b | 0000 | 0dd5 | 0000 | 07d5 |
| 0470660 | 0000 | 09af | ffff | ffff | 0000 | 09a2 | 0000 | 0d43 | 0000 | 0c04 | ffff | ffff | 0000 | 0e0a | 0000 | 1086 | 0000 | 0e36 | 0000 | 0c52 | 0000 | 02cf | 0000 | 0655 |
| 0470740 | 0000 | 0b69 | 0000 | 0788 | ffff | ffff | 0000 | 100b | 0000 | 0f74 | 0000 | 0ede | ffff | ffff | ffff | ffff | 0000 | 0bc1 | 0000 | 0914 | ffff | ffff | 0000 | 0772 |
| 0471020 | 0000 | 091b | 0000 | 0e29 | 0000 | 1145 | 0000 | 0d18 | 0000 | 0f92 | 0000 | 0773 | 0000 | 0e74 | 0000 | 0801 | 0000 | 0ffe | 0000 | 07f2 | 0000 | 1104 | ffff | ffff |
| 0471100 | 0000 | 0f56 | 0000 | 06f9 | ffff | ffff | ffff | ffff | 0000 | 0c8a | ffff | ffff | 0000 | 0b4f | 0000 | 1049 | 0000 | 10f2 | 0000 | 0c7d | ffff | ffff | 0000 | 0b82 |
| 0471160 | 0000 | 02f6 | 0000 | 1004 | 0000 | 0e5f | 0000 | 0b2d | 0000 | 0ecd | 0000 | 10ce | ffff | ffff | 0000 | 0387 | 0000 | 0fe0 | 0000 | 1135 | 0000 | 0b8d | 0000 | 1130 |
| 0471240 | 0000 | 0a04 | ffff | ffff | 0000 | 0cd1 | 0000 | 07eb | 0000 | 0958 | 0000 | 038c | 0000 | 0f1d | 0000 | 0482 | 0000 | 045f | 0000 | 0722 | 0000 | 0a5b | 0000 | 0dac |
| 0471320 | 0000 | 0c3a | 0000 | 0f49 | 0000 | 0c0e | 0000 | 08e0 | 0000 | 1107 | 0000 | 0dcf | 0000 | 0c35 | 0000 | 10b8 | 0000 | 0dda | ffff | ffff | 0000 | 0fa5 | 0000 | 112c |
| 0471400 | 0000 | 0b7d | 0000 | 057e | 0000 | 0d3a | 0000 | 0ed0 | 0000 | 07ed | 0000 | 0208 | 0000 | 0af3 | 0000 | 1030 | ffff | ffff | 0000 | 0750 | 0000 | 0f7e | 0000 | 090f |
| 0471460 | ffff | ffff | ffff | ffff | ffff | ffff | 0000 | 0de5 | 0000 | 0f19 | 0000 | 04f9 | ffff | ffff | ffff | ffff | 0000 | 0fad | 0000 | 01ed | 0000 | 0c99 | 0000 | 04e6 |
| 0471540 | 0000 | 1044 | ffff | ffff | 0000 | 0884 | 0000 | 0dfc | 0000 | 0947 | 0000 | 0cde | ffff | ffff | 0000 | 0780 | 0000 | 0ece | 0000 | 06df | 0000 | 053e | 0000 | 0dee |
| 0471620 | 0000 | 10d3 | 0000 | 053b | 0000 | 0f12 | ffff | ffff | 0000 | 04e7 | 0000 | 08cf | 0000 | 0dc1 | 0000 | 0f61 | 0000 | 017c | ffff | ffff | ffff | ffff | ffff | ffff |
| 0471700 | ffff | ffff | 0000 | 0613 | 0000 | 0978 | 0000 | 05eb | 0000 | 0fc7 | 0000 | 0332 | 0000 | 0733 | 0000 | 04f7 | 0000 | 0efc | 0000 | 1113 | ffff | ffff | 0000 | 10cd |
| 0471760 | 0000 | 1071 | 0000 | 05e0 | ffff | ffff | 0000 | 065a | 0000 | 0bd7 | 0000 | 01ec | 0000 | 09da | 0000 | 0c08 | 0000 | 102f | 0000 | 10c8 | 0000 | 0217 | 0000 | 0f7c |
| 0472040 | ffff | ffff | ffff | ffff | 0000 | 08c6 | ffff | ffff | 0000 | 0eca | 0000 | 0f8a | 0000 | 0f4e | 0000 | 1163 | ffff | ffff | ffff | ffff | 0000 | 07b8 | 0000 | 0dae |
| 0472120 | 0000 | 0d23 | 0000 | 077e | 0000 | 102d | 0000 | 0621 | 0000 | 0641 | 0000 | 0e46 | 0000 | 1000 | 0000 | 104c | 0000 | 0741 | 0000 | 0ee5 | 0000 | 0a3a | ffff | ffff |
| 0472200 | 0000 | 1173 | 0000 | 100f | 0000 | 09e4 | ffff | ffff | ffff | ffff | 0000 | 0de6 | 0000 | 0a99 | ffff | ffff | ffff | ffff | 0000 | 0a79 | 0000 | 0ee9 | ffff | ffff |
| 0472260 | 0000 | 1089 | 0000 | 0ed4 | 0000 | 0fa3 | 0000 | 0ddc | 0000 | 1098 | 0000 | 057f | 0000 | 05bd | 0000 | 0f79 | 0000 | 08fb | 0000 | 1017 | ffff | ffff | 0000 | 046f |
| 0472340 | 0000 | 0b79 | 0000 | 05ef | 0000 | 0c34 | 0000 | 070f | 0000 | 0fbc | 0000 | 0e32 | 0000 | 0152 | 0000 | 0569 | ffff | ffff | 0000 | 0644 | ffff | ffff | 0000 | 1075 |
| 0472420 | 0000 | 0fa6 | 0000 | 0a67 | 0000 | 0ecf | 0000 | 0c5b | 0000 | 1110 | ffff | ffff | 0000 | 1101 | 0000 | 0df2 | 0000 | 0172 | 0000 | 0e5c | 0000 | 031f | ffff | ffff |
| 0472500 | 0000 | 0ded | 0000 | 0cdd | ffff | ffff | ffff | ffff | 0000 | 0fde | 0000 | 04fc | 0000 | 1105 | 0000 | 0a75 | 0000 | 0ca5 | ffff | ffff | 0000 | 06a9 | 0000 | 0d1f |
| 0472560 | ffff | ffff | 0000 | 1066 | 0000 | 0e5a | ffff | ffff | 0000 | 0d76 | 0000 | 06cb | ffff | ffff | 0000 | 0797 | 0000 | 064c | 0000 | 01fa | 0000 | 0b7a | 0000 | 0386 |
| 0472640 | 0000 | 01fe | 0000 | 0f10 | 0000 | 05a4 | 0000 | 099d | ffff | ffff | 0000 | 07bc | 0000 | 0df5 | 0000 | 04d7 | 0000 | 0e0c | ffff | ffff | ffff | ffff | 0000 | 1032 |

| | | | | | | | | | | | | | | | | | | | | | | | | |
|---|---|---|---|---|---|---|---|---|---|---|---|---|---|---|---|---|---|---|---|---|---|---|---|---|
| 0472720 | 0000 | 1154 | 0000 | 065c | 0000 | 0d86 | 0000 | 0be3 | 0000 | 03d4 | ffff | ffff | ffff | ffff | ffff | ffff | 0000 | 1088 | 0000 | 0d4f | 0000 | 0e85 | 0000 | 0a4e |
| 0473000 | ffff | ffff | ffff | ffff | 0000 | 099c | 0000 | 0ddf | 0000 | 107d | 0000 | 0fbe | 0000 | 0ef4 | 0000 | 0f9c | ffff | ffff | 0000 | 103f | 0000 | 0c0c | 0000 | 0ed2 |
| 0473060 | 0000 | 0184 | 0000 | 1176 | ffff | ffff | 0000 | 070c | ffff | ffff | 0000 | 0d4a | 0000 | 0dfd | ffff | ffff | 0000 | 10d8 | 0000 | 0c0d | 0000 | 0408 | ffff | ffff |
| 0473140 | ffff | ffff | 0000 | 1124 | 0000 | 106c | 0000 | 02b7 | 0000 | 0907 | 0000 | 0eb8 | 0000 | 0aa2 | ffff | ffff | 0000 | 098a | ffff | ffff | 0000 | 0efb | 0000 | 114b |
| 0473220 | 0000 | 0746 | 0000 | 1038 | 0000 | 0cb3 | 0000 | 104e | 0000 | 0484 | 0000 | 07af | ffff | ffff | 0000 | 0f6c | 0000 | 0bfe | ffff | ffff | 0000 | 0e05 | 0000 | 1139 |
| 0473300 | 0000 | 044c | ffff | ffff | ffff | ffff | 0000 | 03a4 | 0000 | 09f9 | 0000 | 048a | 0000 | 0aaf | ffff | ffff | 0000 | 1132 | 0000 | 07f9 | 0000 | 0987 | 0000 | 113d |
| 0473360 | 0000 | 115b | 0000 | 1161 | 0000 | 1140 | 0000 | 1162 | 0000 | 1164 | 0000 | 1141 | 0000 | 1168 | 0000 | 117a | 0000 | 10c4 | 0000 | 0615 | 0000 | 0a09 | ffff | ffff |
| 0473440 | 0000 | 0ed9 | 0000 | 06e6 | 0000 | 0145 | 0000 | 0bb7 | 0000 | 10a4 | 0000 | 0533 | ffff | ffff | 0000 | 0564 | 0000 | 1060 | 0000 | 1111 | ffff | ffff | 0000 | 113b |
| 0473520 | 0000 | 096e | 0000 | 0f71 | 0000 | 0a51 | 0000 | 0317 | 0000 | 10f8 | 0000 | 10c5 | 0000 | 04d8 | 0000 | 0df6 | 0000 | 107a | 0000 | 0a7f | 0000 | 1063 | ffff | ffff |
| 0473600 | 0000 | 0462 | 0000 | 10c2 | 0000 | 0aa6 | 0000 | 09ba | 0000 | 0f3f | 0000 | 04f5 | 0000 | 0435 | 0000 | 0e2a | ffff | ffff | 0000 | 0502 | 0000 | 01e2 | 0000 | 06dc |
| 0473660 | ffff | ffff | 0000 | 0503 | 0000 | 05a6 | ffff | ffff | 0000 | 0c73 | 0000 | 103c | 0000 | 10e2 | 0000 | 05b8 | 0000 | 10f6 | 0000 | 053a | 0000 | 0fee | 0000 | 0f7a |
| 0473740 | 0000 | 0b3b | ffff | ffff | 0000 | 1046 | 0000 | 0b93 | 0000 | 05c2 | 0000 | 0bef | 0000 | 0e73 | ffff | ffff | 0000 | 0e0e | ffff | ffff | 0000 | 0a5d | ffff | ffff |
| 0474020 | 0000 | 05c3 | 0000 | 0851 | 0000 | 1010 | 0000 | 0c0f | 0000 | 055c | ffff | ffff | 0000 | 04f6 | 0000 | 0748 | 0000 | 0f47 | 0000 | 0720 | 0000 | 0f8c | ffff | ffff |
| 0474100 | 0000 | 0a71 | 0000 | 0ffd | 0000 | 0c00 | 0000 | 114f | 0000 | 107e | 0000 | 1059 | 0000 | 0e80 | ffff | ffff | 0000 | 0983 | 0000 | 1170 | 0000 | 0c3f | 0000 | 0e7a |
| 0474160 | 0000 | 0a3c | 0000 | 0ebb | 0000 | 0a3d | 0000 | 0dd9 | 0000 | 0ee6 | 0000 | 080f | ffff | ffff | ffff | ffff | 0000 | 0ff9 | 0000 | 0ec8 | 0000 | 08d5 | ffff | ffff |
| 0474240 | 0000 | 0a78 | 0000 | 05f4 | 0000 | 0cbe | 0000 | 073c | 0000 | 10ae | 0000 | 07ca | 0000 | 0a1b | 0000 | 0dd6 | 0000 | 061c | 0000 | 0ca3 | ffff | ffff | 0000 | 0798 |
| 0474320 | 0000 | 1103 | 0000 | 0bda | 0000 | 0e0b | 0000 | 08e3 | 0000 | 1155 | 0000 | 0c0b | 0000 | 0a85 | 0000 | 044b | 0000 | 1109 | 0000 | 07c6 | ffff | ffff | 0000 | 060d |
| 0474400 | 0000 | 0b61 | 0000 | 0c11 | 0000 | 0de9 | 0000 | 1172 | 0000 | 10f4 | 0000 | 0ec3 | 0000 | 094f | ffff | ffff | 0000 | 0650 | ffff | ffff | 0000 | 014b | 0000 | 07f8 |
| 0474460 | 0000 | 0fae | 0000 | 0942 | ffff | ffff | 0000 | 09cb | ffff | ffff | ffff | ffff | ffff | ffff | 0000 | 0904 | 0000 | 0dde | 0000 | 0d8b | 0000 | 0cb7 | ffff | ffff |
| 0474540 | 0000 | 0c45 | 0000 | 0451 | 0000 | 01e9 | 0000 | 0ace | 0000 | 0dc6 | 0000 | 1097 | ffff | ffff | 0000 | 09d3 | ffff | ffff | 0000 | 0a74 | 0000 | 1080 | 0000 | 117b |
| 0474620 | 0000 | 10cc | 0000 | 0d4c | 0000 | 10d5 | 0000 | 07fa | 0000 | 10e4 | 0000 | 09d0 | ffff | ffff | 0000 | 06ae | ffff | ffff | 0000 | 02f8 | 0000 | 0510 | ffff | ffff |
| 0474700 | 0000 | 080b | 0000 | 1127 | ffff | ffff | 0000 | 101c | 0000 | 0da5 | 0000 | 0cac | 0000 | 0ff1 | 0000 | 0547 | 0000 | 0c39 | 0000 | 069a | ffff | ffff | 0000 | 02e0 |
| 0474760 | 0000 | 03a8 | 0000 | 1120 | 0000 | 1065 | ffff | ffff | 0000 | 05f8 | ffff | ffff | 0000 | 0331 | 0000 | 0764 | 0000 | 109a | 0000 | 10c3 | ffff | ffff | ffff | ffff |
| 0475040 | 0000 | 07e7 | 0000 | 0eb5 | 0000 | 0e02 | ffff | ffff | ffff | ffff | 0000 | 0e56 | ffff | ffff | ffff | ffff | 0000 | 0727 | ffff | ffff | 0000 | 05e8 | 0000 | 0559 |
| 0475120 | 0000 | 0c24 | 0000 | 05aa | 0000 | 0dff | 0000 | 05a7 | 0000 | 10f3 | 0000 | 0fb1 | 0000 | 0921 | 0000 | 08ce | 0000 | 115c | 0000 | 0a8e | ffff | ffff | ffff | ffff |
| 0475200 | 0000 | 070a | ffff | ffff | 0000 | 1094 | ffff | ffff | 0000 | 0e14 | 0000 | 0c59 | ffff | ffff | 0000 | 112f | 0000 | 0baf | ffff | ffff | 0000 | 0caf | 0000 | 0f24 |
| 0475260 | ffff | ffff | 0000 | 054d | 0000 | 0e93 | 0000 | 05d1 | 0000 | 0f85 | 0000 | 0b5c | 0000 | 0c25 | 0000 | 1138 | 0000 | 10c0 | 0000 | 0f4c | 0000 | 10f1 | 0000 | 08de |
| 0475340 | 0000 | 0ac7 | ffff | ffff | ffff | ffff | 0000 | 10b7 | 0000 | 10fa | 0000 | 1112 | 0000 | 091d | 0000 | 09e9 | 0000 | 09ea | ffff | ffff | ffff | ffff | 0000 | 054b |
| 0475420 | 0000 | 0c5e | ffff | ffff | ffff | ffff | ffff | ffff | 0000 | 047a | 0000 | 0a59 | 0000 | 0683 | 0000 | 078a | 0000 | 0170 | 0000 | 0a68 | ffff | ffff | ffff | ffff |
| 0475500 | 0000 | 09d2 | ffff | ffff | ffff | ffff | ffff | ffff | 0000 | 0799 | ffff | ffff | ffff | ffff | 0000 | 0b2e | 0000 | 0ae1 | ffff | ffff | ffff | ffff | ffff | ffff |
| 0475560 | ffff | ffff | 0000 | 03e4 | ffff | ffff | 0000 | 09d8 | 0000 | 0c09 | 0000 | 1048 | 0000 | 01d1 | 0000 | 0de3 | 0000 | 0971 | 0000 | 0ea5 | 0000 | 0e6e | 0000 | 08eb |
| 0475640 | ffff | ffff | 0000 | 0ea6 | 0000 | 103e | 0000 | 0c66 | 0000 | 1143 | 0000 | 0ea7 | ffff | ffff | 0000 | 0c05 | ffff | ffff | 0000 | 0ea8 | ffff | ffff | ffff | ffff |
| 0475720 | 0000 | 1092 | 0000 | 0ea9 | 0000 | 1024 | 0000 | 057d | 0000 | 0694 | 0000 | 0eaa | ffff | ffff | ffff | ffff | 0000 | 0b01 | 0000 | 1176 | ffff | ffff | ffff | ffff |
| 0476000 | 0000 | 0b78 | 0000 | 0eac | ffff | ffff | 0000 | 06bc | 0000 | 1001 | ffff | ffff | 0000 | 0fb4 | ffff | ffff | 0000 | 0f99 | 0000 | 02bc | 0000 | 02d1 | ffff | ffff |
| 0476060 | 0000 | 0d5d | 0000 | 0e27 | ffff | ffff | ffff | ffff | ffff | ffff | 0000 | 048c | ffff | ffff | 0000 | 09b2 | 0000 | 10ab | 0000 | 086d | ffff | ffff | 0000 | 071c |
| 0476140 | 0000 | 0f96 | 0000 | 0c81 | ffff | ffff | 0000 | 0e48 | 0000 | 1157 | 0000 | 0eaf | ffff | ffff | ffff | ffff | 0000 | 0e49 | 0000 | 093c | 0000 | 06ac | ffff | ffff |
| 0476220 | 0000 | 10f9 | 0000 | 0850 | 0000 | 0cc1 | ffff | ffff | 0000 | 10a2 | ffff | ffff | ffff | ffff | 0000 | 0f26 | ffff | ffff | ffff | ffff | 0000 | 0e81 | 0000 | 08ef |
| 0476300 | 0000 | 0da3 | ffff | ffff | 0000 | 0c51 | ffff | ffff | 0000 | 0793 | 0000 | 0e65 | 0000 | 08bf | 0000 | 0a2d | 0000 | 0ad7 | 0000 | 065d | 0000 | 0d70 | 0000 | 10b2 |
| 0476360 | 0000 | 0d59 | ffff | ffff | 0000 | 01d6 | ffff | ffff | ffff | ffff | 0000 | 10a9 | ffff | ffff | 0000 | 07f0 | 0000 | 10eb | 0000 | 100d | 0000 | 0cc3 | ffff | ffff |
| 0476440 | 0000 | 1021 | ffff | ffff | 0000 | 0796 | 0000 | 055d | 0000 | 0b70 | 0000 | 0bf5 | 0000 | 0b8f | ffff | ffff | ffff | ffff | ffff | ffff | ffff | ffff | 0000 | 0cc6 |
| 0476520 | 0000 | 0a91 | 0000 | 04af | 0000 | 090a | 0000 | 090b | 0000 | 0c9c | 0000 | 0818 | ffff | ffff | 0000 | 0c4c | 0000 | 095b | 0000 | 1067 | 0000 | 0625 | 0000 | 1115 |
| 0476600 | 0000 | 0eb2 | ffff | ffff | 0000 | 0ae4 | 0000 | 0d6f | 0000 | 10f5 | 0000 | 114c | 0000 | 112a | 0000 | 0d06 | 0000 | 05fe | 0000 | 07d8 | 0000 | 0deb | ffff | ffff |
| 0476660 | 0000 | 04a1 | ffff | ffff | 0000 | 117e | 0000 | 0e01 | ffff | ffff | 0000 | 07f7 | ffff | ffff | 0000 | 1022 | 0000 | 10a1 | 0000 | 0ba1 | 0000 | 0ef6 | 0000 | 110d |
| 0476740 | 0000 | 0a29 | 0000 | 060b | 0000 | 086c | 0000 | 07b6 | 0000 | 07a4 | ffff | ffff | 0000 | 0154 | ffff | ffff | ffff | ffff | 0000 | 0996 | 0000 | 0b39 | ffff | ffff |
| 0477020 | 0000 | 1036 | ffff | ffff | 0000 | 0859 | ffff | ffff | ffff | ffff | ffff | ffff | 0000 | 108a | 0000 | 0549 | ffff | ffff | 0000 | 102e | 0000 | 06f0 | ffff | ffff |
| 0477100 | 0000 | 0d71 | 0000 | 1133 | 0000 | 0a1f | ffff | ffff | 0000 | 0da8 | ffff | ffff | 0000 | 117f | 0000 | 0819 | 0018 | ae0c | 0018 | ae2c | 0018 | b0b8 | 0018 | aecc |
| 0477160 | 0018 | af98 | 0018 | b280 | 0018 | af48 | 0012 | 0578 | 0012 | 0448 | 0018 | aff4 | 0018 | b04c | 0018 | b0e8 | 0014 | 8a84 | 0018 | b214 | 0018 | b330 | 0018 | b39c |
| 0477240 | 0018 | b3f4 | 0018 | b474 | 0018 | b4d4 | 0018 | b536 | 0018 | b57c | 0018 | b59c | 0018 | b658 | 0018 | b6a0 | 0018 | b6d0 | 0018 | b724 | 0018 | b764 | 0018 | b7b4 |
| 0477320 | 0018 | b938 | 0018 | b804 | 0019 | 1e8c | 0015 | aa48 | 0019 | b868 | 0012 | 0888 | 0018 | b8e8 | 0018 | b998 | 0018 | ba9c | 0018 | babc | 0012 | 0968 | 0012 | 09ac |
| 0477400 | 0012 | 09e8 | 0015 | a628 | 0008 | e82c | 0018 | bb6c | 0019 | 2838 | 0015 | a658 | 0015 | a6a8 | 0015 | a6c8 | 0015 | a6e8 | 0012 | 0bbc | 0015 | ab0c | 0012 | 0bfc |
| 0477460 | 0015 | ab2c | 0019 | 1e6c | 0019 | 1eac | 0019 | 1fc0 | 0012 | 0cf8 | 0012 | 0d94 | 0015 | ab4c | 0019 | 1ff4 | 0019 | 2014 | 0019 | 2034 | 0019 | 1f24 | 0019 | 2168 |
| 0477540 | 0012 | 0fb4 | 0019 | 20a0 | 0019 | 20c0 | 0015 | ac64 | 0019 | 2148 | 0015 | aca4 | 0015 | acc4 | 0008 | ea0c | 0019 | 219c | 0019 | 21fc | 0019 | 27f0 | 0019 | 2290 |
| 0477620 | 0019 | 22c4 | 0015 | af88 | 0015 | afa8 | 0019 | c878 | 0015 | afe8 | 0015 | ad3c | 0012 | 13d0 | 0015 | b5f0 | 0015 | b124 | 0019 | 23e4 | 0019 | 2404 | 0019 | 2424 |
| 0477700 | 0019 | 2480 | 0015 | b6dc | 0016 | bdb8 | 0016 | bcac | 0015 | b268 | 0015 | b298 | 0008 | c10c | 0015 | b304 | ffff | ffff | 0012 | 344c | 0015 | b41c | 0019 | 2f30 |
| 0477760 | 0015 | b59c | 0015 | b818 | 0012 | 370c | 0012 | 757c | 0012 | 73fc | 0012 | 3884 | 0019 | cbcc | 0012 | 3940 | 001a | 4718 | 0012 | 39b8 | 0012 | 39f8 | 0012 | 3a70 |

```
0500040 0019 2ed4 0012 3bc0 0012 3cc4 0012 3d8c 0012 4514 0015 b880 0012 3fa4 0019 d1b0 0015 b92c 0012 42c4 0015 b9f0 0019 297c
0500120 0015 ba54 0012 45ec 0012 4668 0012 46cc 0012 4730 0019 2a84 0012 47f8 0015 bb98 0012 48dc 0012 4940 0012 4a70 0012 4ad4
0500200 0012 4b4c 0012 4bdc 0012 4c54 0011 eca8 0010 d69c 0012 4cd0 0012 4d54 0019 2c70 0012 4db0 0012 4e20 0012 4e8c 0012 5000
0500260 0012 5070 0012 50e0 ffff ffff 0012 5164 ffff ffff 0012 737c 0012 73dc 0012 746c 0012 74d8 0012 7544 0019 2f64 0012 75fc
0500340 0012 7680 0012 76b8 0019 2ff4 0012 773c 0012 7788 0012 77d4 0012 7808 0012 783c 0012 785c 0012 787c 0019 3014 0012 78e8
0500420 0019 976c 0010 e78c 0012 79bc 000b 3bf8 000b 3c84 000b 3d50 000b 3ddc 000b 3e58 0016 4450 0016 4470 0016 4490 0019 94b8
0500500 0019 962c 0019 966c 0019 96ac 0019 96ec 0019 972c 000b 4ea4 0019 9548 0019 95c4 000b 6800 000b 53d8 0019 97a0 000b 55dc
0500560 0019 9a54 000b 577c 0016 440c 0016 4578 0016 4598 000b 5d2c 000b 5dac 0019 2c2c 000b 6040 0016 45d0 000b 6418 0019 1ecc
0500640 0019 9c44 0016 469c 0019 2128 000b 6f40 000b 5a18 0019 98cc 000b 7354 000b 7458 000b 757c 000b 76b4 000b 77e0 000b 7864
0500720 000b 797c 0019 9f00 000b 7a48 000b 7b00 0017 a8f4 000b 7b40 0016 4924 000b 7da0 000b 7e34 0016 48d8 0016 49c4 0017 f344
0501000 0016 4a64 0012 9b54 0011 1c1c 0011 1e80 0019 9c7c 0019 9d74 0012 bbdc 0018 1768 0016 4ad4 0018 ac00 0012 bc7c 0012 bcb0
0501060 0012 bc1c 0012 b300 0016 4c58 0012 bd74 0019 9b9c 0019 9bbc 0012 be14 0012 be4c 0012 be84 0012 bec0 0012 befc 0016 4c78
0501140 0019 9e64 0012 bfb4 0012 bfd4 0019 9ed0 0012 c028 0012 c05c 0019 9f6c 0019 9f9c 0019 9fec 0017 7bac 0019 c1d8 0019 c210
0501220 0019 c24c 0019 c26c 0019 c28c 0019 c2ac 0016 b584 0016 b2f4 0019 c338 0012 c428 0016 b35c 0016 b388 0016 b3b4 0016 b418
0501300 0012 c614 0012 c668 0012 c6e0 0016 b564 0019 c45c 0019 c47c 0019 c49c 0016 b660 0019 c318 0019 c524 0019 c544 0019 c620
0501360 0019 c640 0019 c660 0019 c680 0019 c6e8 0012 ec38 0011 2f28 0019 c760 0019 c7e4 0019 c804 0019 ca40 0019 c990 0019 c9b0
0501440 0019 caa8 0012 e1a0 0019 cb50 0019 cbec 0012 ec78 0012 ef38 0019 cd08 0019 cd88 0012 efe4 0019 ce84 0019 cf6c 0019 cf2c
0501520 0019 cf4c 0012 f148 0012 f1a0 0012 f1c0 001a 4014 0012 f22c 0019 d0bc 0019 d170 0019 d190 0019 d1d0 0017 9fd4 0019 d2a4
0501600 0019 d318 0019 d3c4 0019 d3e4 0019 d404 0019 d50c 0018 bc78 0018 bca8 0018 bcd8 0011 3b70 0013 376c 0013 37fc 0013 381c
0501660 0011 3ca0 0011 3cc0 0011 3ce0 0013 a374 000e 4788 0011 3d34 0011 3dac 0011 3dcc 0011 3dfc 0011 4b6c 0013 78b8 0013 78d8
0501740 0013 7a18 0013 7918 0013 7984 0013 79c4 0013 7ae8 0011 40a8 0019 2ae8 0013 7c70 0013 7c90 0013 7cdc 0013 7cfc 0013 7d1c
0502020 0011 4208 0013 7470 0013 7d90 0013 7de0 001a 38a8 0017 a40c 001a 442c 001a 44a0 001a 44d4 001a 44f4 001a 4514 001a 4534
0502100 001a 43ec 001a 45ec 001a 463c 001a 465c 001a 46a4 001a 46f8 0013 829c 0013 82bc 0011 481c 0013 a31c 0013 a354 0011 48e4
0502160 0011 4950 0011 49dc 0011 4a0c 0017 aa4c 0017 a970 0017 a990 0017 aa10 0013 e778 0013 e798 0013 e7dc 0013 e81c 0013 e864
0502240 0011 4ea8 0013 e844 0014 08a4 0014 08c4 0014 0920 0014 0940 0014 0974 0014 09fc 0014 0a30 0014 0994 0018 abb0 0014 0ae0
0502320 0014 0b4c 0014 0bb4 0014 0bd4 0011 5410 0019 2df0 0011 54f8 0011 5528 0011 5568 0011 55f4 0017 f3a4 0017 f434 0011 56f0
0502400 0017 eeb4 0017 eed4 0017 efe0 0017 f09c 000b 3bb4 0017 f228 0014 0d04 0018 1514 0014 0dc0 0018 1550 0018 1570 0018 1590
0502460 0014 0ed4 0014 0e38 0014 0fd0 0014 0ff0 0014 1120 0014 1140 0014 1160 0014 11f8 0014 11d8 0019 9300 0018 16d4 0011 6114
0502540 0011 6134 0011 6160 0014 1344 0014 137c 0018 1690 0011 62d8 0013 36ac 0011 6474 0011 6494 0011 64b4 0011 6518 0011 662c
0502620 0015 355c 0015 357c 0015 359c 0018 bc48 0015 362c 0015 368c 0015 36ec 0015 374c 0015 37ac 0015 37dc 0015 389c 0015 38fc
0502700 0015 392c 0015 395c 0015 39ec 0015 3a7c 0015 3b0c 0015 3b6c 0015 3b9c 0015 3bcc 0015 3bfc 0018 39c4 0018 3a04 0018 3a54
0502760 0018 3af4 0018 3b24 0018 3b44 0014 7e28 0018 3bc4 0018 3c24 0014 7fec 0014 81c0 0014 81e0 0014 89e8 0018 aaf0 0011 ff70
0503040 0014 7d98 0014 7edc 0014 7f18 0018 ab70 0018 ac78 0018 a130 0018 a1c4 0018 a458 0018 a520 0018 a72c 0018 a994 0015 3b3c
0503120 0018 a600 0018 a968 0016 1dbc 0018 ade0 0008 ecec ffff ffff ffff ffff ffff ffff ffff ffff ffff ffff ffff ffff ffff ffff
0503200 ffff ffff ffff ffff ffff ffff ffff ffff ffff ffff ffff ffff ffff ffff ffff ffff ffff ffff ffff ffff ffff ffff ffff ffff
*
0505100 ffff ffff ffff ffff ffff ffff ffff ffff ffff ffff ffff ffff ffff ffff ffff ffff 0000 1183 bfb0 0000 0008 ac3c 27f0 0000
0505160 000a 190a 2520 247c 0008 c05c 000c 7480 0000 0000 000a 18f8 000a 18f8 261c 2794 b610 bd04 0008 abdc 0000 005c 0000 0000
0505240 0000 0000 0000 0000 0000 0000 0000 0000 0000 0000 0000 0001 0000 0000 0000 0001 0000 0001 0000 0000 0000 0000 0000 0000
0505320 0000 0000 0000 0000 0000 000f 0000 0001 0001 86a0 0000 0000 0000 0001 0000 0000 0000 0000 0000 0000 0000 0000 0000 0000
0505400 0000 0000 0000 13fe 000a a058 0000 000c 0000 0000 0000 0001 0000 0001 0000 000a 0000 0000 0000 000f 0000 0000 0000 0001
0505460 0000 0158 0000 0008 0000 0000 0000 3427 0000 0000 0000 0000 0000 0001 0000 0001 0000 0000 0000 0000 0002 438a 0000 0000
0505540 0000 0000 0000 0000 0000 0000 0000 0000 0000 0000 0010 0000 0000 0001 3f80 0000 3f80 0000 0008 b07c 0008 be5c 0008 da9c
0505620 0008 db3c 0008 c05c 0008 ac3c 0008 abdc 0000 0000 0000 0000 0000 0000 0000 001a 4728 0008 eb3c 0008 c47c 0008 af5c 0000 0000
0505700 0002 438a 000a 18f0 000a 18f0 000a 191e 000a 1910 0000 0000 0000 0000 0000 0000 0000 0000 0000 0000 0000 0001 0000 0000
0505760 000a 18f8 000a 1904 0009 ecec 0008 04c8 0000 008e 0000 0005 0000 0001 000a 1c1c 000a 1c15 000a 1bbd 000a 1c6c 000a 1bcd
0506040 000a 1c9c 000c 0005 000c 00b5 000c 00d5 000c 00f5 000c 0115 000a 1cec 000a 1cfc 000a 1d0c 0000 0000 0000 0000 000a 1d1c
0506120 000a 1d2c 0000 0000 0000 0000 0000 0000 000c 008c 000a 1bd4 000a 1d3c 0000 0000 0000 0000 000a 1bf0 000a 1d4c 000a 1d5c
0506200 0000 0000 0000 0000 0000 0000 0000 0000 0000 0000 0000 0000 000a 1d6c 0000 0000 000c 011c 000c 012c 000a 1d7c 0000 0000
0506260 000a 1d8c 000a 119c 000a 1dac 0000 0000 0000 0000 0000 0000 000a 1dbc 000a 1dcc 000a 1ddc 0000 0000 0000 0000 000a 1dec
0506340 000a 1dfc 000a 1b98 0000 0000 0000 0000 000a 1e0c 000a 1e1c 000a 1e2c 000a 1e3c 000a 1e4c 000a 1e5c 000a 1e6c 0000 0db7
0506420 b464 0000 0007 94c4 000a 1ba8 b464 0000 0007 9524 0000 0000 000a 1c5c 0000 0000 000a 1c4c 000a 1bb4 000a 1c8c 0000 0000
0506500 000a 1c7c 000a 1bc4 0000 0ab7 b464 0000 0007 9a94 000a 1be4 b464 0000 0007 9b54 0000 0000 0000 0ad7 b464 0000 0007 9ac4
0506560 000a 1c00 b464 0000 0007 9b84 0000 0000 000a 1c3c 0000 0000 000a 1c2c 000a 1c0c 0000 0e07 b328 0000 0007 9944 0000 0000
0506640 0000 0e0f b328 0000 0007 9a04 0000 0000 0000 280f b328 0000 0007 9ca4 0000 0000 0000 0e17 b328 0000 0007 9824 0000 0000
```

```
0506720 0000 2817 b328 0000 0007 9584 0000 0000 0000 0e1f b328 0000 0007 9974 0000 0000 0000 0e27 b328 0000 0007 99d4 0000 0000
0507000 0000 2a27 b328 0000 0007 9764 0000 0000 0000 0e2f b328 0000 0007 9334 0000 0000 0000 0e37 b328 0000 0007 9c74 0000 0000
0507060 0000 2c3f b328 0000 0007 95b4 0000 0000 0000 0e47 b328 0000 0007 9554 0000 0000 0000 0e57 b328 0000 0007 9884 0000 0000
0507140 0000 0e5f b328 0000 0007 98e4 0000 0000 0000 0e67 b328 0000 0007 98b4 0000 0000 0000 0e6f b328 0000 0007 9914 0000 0000
0507220 0000 0a87 b328 0000 0007 9c14 0000 0000 0000 288f b328 0000 0007 9614 0000 0000 0000 0abf b328 0000 0007 96d4 0000 0000
0507300 0000 0adf b328 0000 0007 94f4 0000 0000 0000 0ae7 b328 0000 0007 96a4 0000 0000 0000 211f b328 0000 0007 95e4 0000 0000
0507360 0000 0b3f b328 0000 0007 9bb4 0000 0000 0000 2f4f b328 0000 0007 9734 0000 0000 0000 0b57 b328 0000 0007 9be4 0000 0000
0507440 0000 0b5f b328 0000 0007 9b24 0000 0000 0000 177f b328 0000 0007 9704 0000 0000 0000 1787 b328 0000 0007 9af4 0000 0000
0507520 0000 178f b328 0000 0007 9854 0000 0000 0000 17a7 b328 0000 0007 9cd4 0000 0000 0000 0daf b328 0000 0007 9a64 0000 0000
0507600 0000 27cf b328 0000 0007 9644 0000 0000 0000 25d7 b328 0000 0007 97c4 0000 0000 0000 0ddf b328 0000 0007 9674 0000 0000
0507660 0000 0de7 b328 0000 0007 99a4 0000 0000 0000 0def b328 0000 0007 9c44 0000 0000 0000 0df7 b328 0000 0007 9794 0000 0000
0507740 0000 0dff b328 0000 0007 97f4 0000 0000 0000 0000 000a a7a4 0000 0000 0000 0000 000a a9d4 000a a7bd 000a a87d 0000 0000
0510020 000c 0290 0000 0000 000a 1f0c 0000 0000 000a 1edc 0000 0000 000a 1ecc 000a 1eac 0000 3fdf b464 0010 000a ff58 000c 0bc8
0510100 0000 27c7 b328 0000 0007 fadc 0000 0000 0000 31c7 b328 0000 0007 ea1c 0000 0000 0000 20cf b328 0000 0007 f81c 0000 0000
0510160 0000 255f b328 0000 0007 f0dc 0000 0000 0000 1ea7 b328 0000 0007 f39c 0000 0000 0000 2c27 b328 0000 0007 e05c 0000 0000
0510240 0000 1dff b328 0000 0007 ff1c 0000 0000 0000 217f b328 0000 0007 e81c 0000 0000 002a 2f68 6f6d 652f 6f73 6173 322f 622f
0510320 7175 696e 7475 732f 7077 312e 312f 6c69 6272 6172 792f 736f 6673 746b 0000 0000 002d 2f68 6f6d 652f 6f73 6173 322f 622f
0510400 7175 696e 7475 732f 7077 312e 312f 6c69 6272 6172 792f 736f 6673 746b 2e70 6c00 0035 2f68 6f6d 652f 6f73 6173 322f 622f
0510460 7175 696e 7475 732f 6765 6e65 7269 632f 7170 6c69 6232 2e35 2f6c 6962 7261 7279 2f73 6f66 7374 6b00 0038 2f68 6f6d 652f
0510540 6f73 6173 322f 622f 7175 696e 7475 732f 6765 6e65 7269 632f 7170 6c69 6232 2e35 2f6c 6962 7261 7279 2f73 6f66 7374 6b2e
0510620 706c 00f8 0000 002c 000d d950 b27c b66c 0000 0403 7fff ffff 000d 8484 0200 0db5 0200 2f35 0000 49b7 0000 02b3 0000 315f
0510700 000a 2308 0000 0000 000a 22f8 000a 204c 000a 2358 0000 0000 000a 2348 000a 205c 000a 2398 0000 0000 000a 2368 000a 20b4
0510760 000a 23b8 0000 0000 000a 23a8 000a 207c 000a 2388 000a 206c 000a 23e8 0000 0000 000a 23d8 000a 2094 000a 21c8 0000 0000
0511040 000a 21b0 000a 20a4 000a 2378 000a 208c 000a 2198 000a 20cc 000a 2188 000a 20bc 000a 21a8 0000 0000 000a 2298 000a 20e4
0511120 0010 91e8 0000 0000 000a 22a8 0000 0000 000a 2208 000a 20fc 000a 21f8 000a 20ec 000a 2218 000a 2104 000a 2228 000a 210c
0511200 000a 2238 000a 2114 000a 2248 000a 211c 000a 2258 0000 0000 000a 2338 0000 0000 000a 2328 000a 2124 000a 21d8 0000 0000
0511260 000a 2448 000a 2144 000a 2468 000a 214c 000a 2478 000a 2154 000a 2488 0000 0000 b328 0000 0007 dc6c 0000 0000 0100 2a27
0511340 b328 0000 0007 d7d0 0000 0000 0200 206f b328 0000 0007 db70 0000 0000 0100 3277 b328 0000 0007 dd00 0000 0000 0200 3277
0511420 b328 0000 0007 dd30 0000 0000 0300 3277 b328 0000 0007 dd64 0000 0000 0100 1c7f b328 0000 0007 db0c 0000 0000 0200 1c7f
0511500 b328 0000 0007 db3c 0000 0000 0300 2287 b328 0000 0007 d8dc 0000 0000 0100 2897 b328 0000 0007 de7c 0000 0000 0100 1ea7
0511560 b328 0000 0007 d70c 0000 0000 0200 1ea7 b328 0000 0007 f5f0 0000 0000 0300 1ea7 b328 0000 0007 f624 0000 0000 0400 1ea7
0511640 b328 0000 0007 f65c 0000 0000 0500 1ea7 b328 0000 0007 f698 0000 0000 0600 1ea7 b328 0000 0007 f6d8 0000 0000 0700 1ea7
0511720 b328 0000 0007 f71c 0000 0000 0300 2eaf b328 0000 0007 d86c 0000 0000 0100 26bf b328 0000 0007 dc0c 0000 0000 0100 24df
0512000 b328 0000 0007 d73c 0000 0000 0200 26df b328 0000 0007 dd9c 0000 0000 0300 26df b328 0000 0007 dd30 0000 0000 0400 08e7
0512060 b328 0000 0007 de40 0000 0000 0300 0907 b328 0000 0007 de08 0000 0000 0200 2f2f b328 0000 0007 dba4 0000 0000 0200 1d37
0512140 b328 0000 0007 f5bc 0000 0000 0200 2b47 b328 0000 0007 d800 0000 0000 0300 2b47 b328 0000 0007 d834 0000 0000 0100 2f4f
0512220 b328 0000 0007 d7a0 0000 0000 0100 255f b328 0000 0007 f1c4 0000 0000 0300 295f b328 0000 0007 f8d0 0000 0000 0100 1d6f
0512300 b328 0000 0007 d914 0000 0000 0200 1d6f b328 0000 0007 d944 0000 0000 0100 1d77 b328 0000 0007 d978 0000 0000 0100 2177
0512360 b328 0000 0007 dcd0 0000 0000 0100 2d77 b328 0000 0007 da40 0000 0000 0200 1d77 b328 0000 0007 d9a8 0000 0000 0100 1d7f
0512440 b328 0000 0007 d9dc 0000 0000 0200 1d7f b328 0000 0007 da0c 0000 0000 0100 2d87 b328 0000 0007 da70 0000 0000 0200 1f8f
0512520 b328 0000 0007 daa0 0000 0000 0300 1f8f b328 0000 0007 dad4 0000 0000 0200 17a7 b328 0000 0007 d76c 0000 0000 0200 2baf
0512600 b328 0000 0007 dbd8 0000 0000 0100 1fc7 b328 0000 0007 dca0 0000 0000 0100 2bdf b328 0000 0007 f1f4 0000 0000 0300 1de7
0512660 b328 0000 0007 d3a4 0000 0000 0100 1dff b328 0000 0008 0378 0000 0000 0100 1fff b328 0000 0007 dc3c 0000 0000 0200 1dff
0512740 b328 0000 0008 03a8 0000 0000 0300 1dff b328 0000 0008 03dc 0000 0000 0400 1dff b328 0000 0008 0414 0000 0000 0008 ce2c
0513020 0300 38f7 0000 38c7 0000 000c 000b 585c 000b 585c 0001 0047 0000 0000 000a 3a98 0000 0000 000a 2528 0000 0000 000a 24f8
0513100 0000 0000 000a 24e8 000a 24c8 0010 844c 000a 24b8 000c 0674 000a 3294 0000 27c7 b328 0000 0007 fa84 0000 0000 0000 31c7
0513160 b328 0000 0007 e9c4 0000 0000 0000 20cf b328 0000 0007 f7c4 0000 0000 0000 255f b328 0000 0007 f084 0000 0000 0000 1ea7
0513240 b328 0000 0007 f344 0000 0000 0000 2c27 b328 0000 0007 e004 0000 0000 0000 1dff b328 0000 0007 fec4 0000 0000 0000 217f
0513320 b328 0000 0007 e7c4 0000 0000 0014 12a0 0100 21ef 0000 6e3f 0000 0004 0014 7d60 0014 7d60 0001 0075 0000 0000 0000 3287
0513400 b464 0000 0007 df04 000a 2598 b464 0000 0007 df30 000a 25a4 b464 0000 0007 df5c 000a 25b0 b464 0000 0007 df88 000b 1690
0513460 0000 20cf b464 0000 0007 f9c8 000a 25cc b464 0000 0007 f9f4 0000 0000 0005 5167 4f6e 6500 000a 25e8 0000 0000 0000 27c7
0513540 b464 0000 0007 fe00 000a 25f8 b464 0000 0007 fe2c 0000 0000 0000 255f b328 0000 0007 f2e4 0000 0000 0000 1dff b328 0000
0513620 0008 047c 0000 0000 0000 0034 000b b444 b27c b66c 0000 0146 7fff ffff 000b b4e8 0200 0db5 0400 24ad 0000 23a7 0000 001b
0513700 0000 39cf 0000 2c27 0000 315f 0006 6169 7475 6161 000a 2664 000e 6f70 0000 0000 0013 ae0c 0000 0000 000a 2684 0000 0000
0513760 000a 26cc 0000 0000 0000 1ea7 b464 0000 0007 f284 000a 2694 b464 0000 0007 f934 000f d778 0000 2fe7 b464 0000 0007 f250
```

```
0514040  000a 26b0 b464 0000 0007 f968 0000 0000 0000 308f b328 0000 0007 a760 0000 0000 0000 2917 b464 0000 0007 e938 000b 0520
0514120  0000 3297 b328 0000 0007 a7c8 0000 0000 0000 329f b328 0000 0007 a794 0000 0000 0000 2257 b328 0000 0007 a6f8 0000 0000
0514200  0000 2b6f b328 0000 0007 a72c 0000 0000 0000 217f b328 0000 0007 e72c 0000 0000 0000 267f b328 0000 0007 a6c4 0000 0000
0514260  000a 2740 0000 1597 b328 0000 000a a9a0 0000 0000 0000 0034 0010 20e4 b27c b66c 0000 06de 7fff ffff 000a 278c 0200 0db5
0514340  0400 242d 0000 512f 0000 000b 0000 510f 0000 21cf 0000 315f 0000 0034 000a 2758 b27c b66c 0000 06df 7fff ffff 000a 27c0
0514420  0200 0db5 0400 242d 0000 5137 0000 000b 0000 510f 0000 21cf 0000 315f 0000 0034 000a 278c b27c b66c 0000 06e0 7fff ffff
0514500  000a 2f08 0200 0db5 0400 242d 0000 5137 0000 0013 0000 510f 0000 21cf 0000 315f 0000 0034 000d aac0 b27c b66c 0000 06e2
0514560  7fff ffff 000a 2828 0200 0db5 0400 24ad 0000 2c1f 0000 000b 0000 510f 0000 31c7 0000 315f 0000 0034 000a 27f4 b27c b66c
0514640  0000 06e3 7fff ffff 000a 285c 0200 0db5 0400 24ad 0000 28ef 0000 001b 0000 510f 0000 31c7 0000 315f 0000 0034 000a 2828
0514720  b27c b66c 0000 06e4 7fff ffff 000a 2994 0200 0db5 0400 24ad 0000 290f 0000 001b 0000 510f 0000 31c7 0000 315f 002a 2f68
0515000  6f6d 652f 6f73 6173 322f 622f 7175 696e 7475 732f 7077 312e 312f 6c69 6272 6172 792f 7072 6f6d 7074 0000 000b 000b b4e8
0515060  002d 2f68 6f6d 652f 6f73 6173 322f 622f 7175 696e 7475 732f 7077 312e 312f 6c69 6272 6172 792f 7072 6f6d 7074 2e70 6c00
0515140  0010 a9ac 0000 0034 000a 2f08 b27c b66c 0000 06ec 7fff ffff 000a 292c 0200 0db5 0400 242d 0000 515f 0000 0013 0000 2c0f
0515220  0000 21cf 0000 315f 0000 0034 000a 28f8 b27c b66c 0000 06ed 7fff ffff 000a 2960 0200 0db5 0400 242d 0000 5167 0000 0013
0515300  0000 2c0f 0000 21cf 0000 315f 0000 0034 000a 292c b27c b66c 0000 06ee 7fff ffff 0012 a8fc 0200 0db5 0400 242d 0000 5167
0515360  0000 001b 0000 2c0f 0000 21cf 0000 315f 0000 0034 000a 285c b27c b66c 0000 06ef 7fff ffff 000a 29c8 0200 0db5 0400 24ad
0515440  0000 3ecf 0000 000b 0000 2c0f 0000 3e0f 0000 315f 0000 0034 000a 2994 b27c b66c 0000 06f0 7fff ffff 000b b478 0200 0db5
0515520  0400 24ad 0000 3f7f 0000 0013 0000 2c0f 0000 3e17 0000 315f 0000 002c 0010 1f54 b27c b66c 0000 0b11 7fff ffff 0012 a8a4
0515600  0200 0db5 0200 24bd 0000 3287 0000 4e9f 0000 315f 0000 002c 000a d00c b27c b66c 0000 139b 7fff ffff 0019 d870 0200 0db5
0515660  0200 2f35 0000 8aff 0000 046b 0000 315f 0000 002c 000a d0ac b27c b66c 0000 13cb 7fff ffff 0019 d89c 0200 0db5 0200 224d
0515740  0000 8aff 0000 3287 0000 315f 2c78 0014 0002 438a 35c8 31f0 239c 0000 0013 7d2c 003e 2f68 6f6d 652f 6f73 6173 312f 612f
0516020  7669 6a61 792f 5648 444c 2f70 6172 7365 722f 7072 6f6c 6f67 2f6e 6577 6e65 772f 7633 2e31 2f70 6172 7469 7469 6f6e 6572
0516100  000a 2aed 000a 2c3c 0000 00dc 0000 0363 0000 046b 0000 315f 000a 2b14 0000 002c b4f0 b4e4 0000 139d 7fff ffff 0008 cc5d
0516160  0000 0000 0000 0000 000a 2ac0 0002 438a 001a 4108 000a 2b4c 0000 0038 b27c b66c 0000 139f 0000 13cc 000a 2b7c 0200 0db5
0516240  0500 1cdd 0000 6947 0000 002b 0000 3287 0097 6243 0000 046b 0000 315f 000a 2b78 0000 002c b4f0 b4e4 0000 139e 7fff ffff
0516320  0008 b0dd 0000 0000 0000 0000 000b 839c 0002 438a 001a 43b8 000a 2c3c 0000 0038 b27c b66c 0000 13a0 0000 13cd 000b 70f0
0516400  0200 0db5 0500 1cdd 0000 6977 0000 001b 0000 3287 0097 6343 0000 046b 0000 315f 0000 0060 000b 7028 b27c b66c 0000 13a1
0516460  7fff ffff 000a 2c8c 0200 0db5 0500 6945 0200 61bd 0200 0ad5 0000 2ad7 0000 005b 0100 61bd 0200 0ad5 0000 6317 0000 0033
0516540  0100 61bd 0200 0ad5 0000 6317 0000 001b 0000 8b07 0000 0023 0000 0023 0000 315f 0000 002c 000a 2c14 b4f0 b4e4 0000 13a0
0516620  7fff ffff 0012 ec49 0000 0000 0000 0001 000a 2bb4 0002 438a 001a 418c 000a b000 0000 0044 0000 315f 000a 2c88 0000 0038
0516700  b27c b66c 0000 0b23 0000 0b86 000b 37c8 0200 0db5 0500 1cdd 0000 5fa7 0000 000b 0000 3287 0090 0503 0000 034b 0000 315f
0516760  0012 54fc 0000 0000 0000 0060 000a 2bb4 b27c b66c 0000 13a2 7fff ffff 000a 2cec 0200 0db5 0500 6945 0200 61bd 0200 0ad5
0517040  0000 2ad7 0050 0053 0100 61bd 0200 0ad5 0000 6317 0000 0033 0100 61bd 0200 0ad5 0000 6317 0000 001b 0000 8b07 0000 001b
0517120  0000 001b 0000 315f 0000 0060 000a 2c8c b27c b66c 0000 13a3 7fff ffff 000b 37c8 0200 0db5 0500 6945 0200 61bd 0200 0ad5
0517200  0000 2ad7 0000 004b 0100 61bd 0200 0ad5 0000 6317 0000 0033 0100 61bd 0200 0ad5 0000 6317 0000 001b 0000 8b07 0000 0023
0517260  0000 0023 0000 315f 0000 004c 000b 7128 b27c b66c 0000 13af 7fff ffff 000b 80f0 0200 0db5 0300 8a2d 0200 61bd 0200 0ad5
0517340  0000 2ad7 0000 0013 0100 61bd 0200 0ad5 0000 6317 0000 0033 0000 7497 0000 0023 0000 315f b464 0000 000a 2d50 001a 41ec
0517420  0035 2f68 6f6d 652f 6f73 6173 322f 622f 7175 696e 7475 732f 6765 6e65 7269 632f 7170 6c69 6232 2e35 2f6c 6962 7261 7279
0517500  2f70 726f 6d70 7400 0038 2f68 6f6d 652f 6f73 6173 322f 622f 7175 696e 7475 732f 6765 6e65 7269 632f 7170 6c69 6232 2e35
0517560  2f6c 6962 7261 7279 2f70 726f 6d70 742e 706c 00a4 0000 002c 0010 43ec b27c b66c 0000 06e6 7fff ffff 0010 1ee8 0200 0db5
0517640  0200 2f35 0000 5157 0000 0303 0000 315f 27f0 0024 000b 1370 45b8 46ec 3b4c 0000 0012 4e30 0014 3858 320c 39a4 000b 4864
0517720  000c 2eb0 0010 93cc 0000 0000 0000 002c 0010 1f14 b27c b66c 0000 06fb 7fff ffff 000f f910 0200 0db5 0200 224d 0000 5157
0520000  0000 2c0f 0000 315f 000e 7265 6164 2063 6f6e 7374 616e 7473 0000 0000 2c78 0014 0002 438a 362c 320c 31f0 22bc 000a e794
0520060  2c78 0014 0002 438a 3640 320c 239c 0000 000a e794 000b 289c 0000 002c 0010 1f80 b27c b66c 0000 06ea 7fff ffff 0012 a8d0
0520140  0200 0db5 0200 294d 0000 2c0f 0000 5157 0000 315f 0000 0034 000a 27c0 b27c b66c 0000 06eb 7fff ffff 000a 28f8 0200 0db5
0520220  0400 242d 0000 2c0f 0000 000b 0000 2c0f 0000 21cf 0000 315f 0317 6d61 7962 6520 736b 6970 2072 6573 7420 6f66 206c 696e
0520300  6500 8e15 0000 1c7f b464 0000 0007 a9c8 000a 2f60 b464 0000 0007 a9fc 0000 0000 0000 1d6f b464 0000 0007 ab00 000a 2f7c
0520360  b464 0000 0007 ab34 0000 0000 0000 1d77 b464 0000 0007 ab68 000a 2f99 b464 0000 0007 ab9c 0000 0000 0000 1d7f b464 0000
0520440  0007 abd0 000a 2fb4 b464 0000 0007 ac04 0000 0000 0000 1f8f b464 0000 0007 add8 000a 2fd0 b464 0000 0007 ae0c 0000 0000
0520520  0000 2057 b464 0000 0007 b014 000a 2fec b464 0000 0007 b048 0000 0000 0011 4ca0 000a 3304 0000 0000 000a 2ff9 0011 bc90
0520600  0000 0000 000a 3a58 0000 0000 0011 ba14 0000 0000 0011 2f18 000c a58c 0000 22f7 b464 0000 0007 b424 000a 3038 b464 0000
0520660  0007 b458 0000 0000 0000 23a7 b464 0000 0007 b55c 000a 3054 b464 0000 0007 b590 000a 3528 0000 23af b464 0000 0007 b5c4
0520740  000a 3070 b464 0000 0007 b5f8 0000 0000 0000 2447 b464 0000 0007 b660 000a 308c b464 0000 0007 b694 0000 0000 0000 26bf
0521020  b464 0000 0007 b89c 000a 30a8 b464 0000 0007 b8d0 0000 0000 0000 26df b464 0000 0007 b904 000a 30c4 b464 0000 0007 b938
0521100  0000 0000 0000 275f b464 0000 0007 b9a0 000a 30e0 b464 0000 0007 b9d4 0000 0000 0000 2827 b464 0000 0007 baa4 000a 30fc
```

```
0521160 b464 0000 0007 bad8 0000 0000 0000 2987 b464 0000 0007 bba8 000a 3118 b464 0000 0007 bbdc 0000 0000 0000 2b47 b464 0000
0521240 0007 bf50 000a 3134 b464 0000 0007 bf84 0000 0000 0000 2bcf b464 0000 0007 c054 000a 3150 b464 0000 0007 c088 0000 0000
0521320 0000 2bff b464 0000 0007 c0bc 000a 316c b464 0000 0007 c0f0 0000 0000 0000 2c47 b464 0000 0007 c1c0 000a 3188 b464 0000
0521400 0007 c1f4 0000 0000 0000 2ccf b464 0000 0007 c228 000a 31a4 b464 0000 0007 c25c 0000 0000 0002 6f72 0000 0000 0010 b0c8
0521460 000a 31dc 0000 215f b464 0000 0007 c3c8 000a 31d0 b464 0000 0007 c3fc 0000 0000 0010 afd8 0000 0000 0010 b0b4 000a 31ec
0521540 0010 ae98 0000 0000 0002 6f66 0000 0000 0000 21cf b464 0000 0007 c4cc 000a 320c b464 0000 0007 c500 0000 0000 000a 4498
0521620 0000 0000 000a 3644 0000 0000 0000 2ef7 b464 0000 0007 c6a0 000a 3238 b464 0000 0007 c6d4 0000 0000 0000 2f2f b464 0000
0521700 0007 c73c 000a 3254 b464 0000 0007 c770 0000 0000 0010 a4b4 000a 328c 000a 2fc0 0000 0000 0000 2f8f b464 0000 0007 c7d8
0521760 000a 3280 b464 0000 0007 c80c 0000 0000 000d 6980 0000 0000 000a 4558 0000 0000 0000 2fbf b464 0000 0007 c874 000a 32ac
0522040 b464 0000 0007 c8a8 0000 0000 000a 3a78 0000 0000 000a 45d8 0000 0000 0003 7673 3100 0000 0011 bc30 000a dbc4 0000 3047
0522120 b464 0000 0007 c978 000a 32e8 b464 0000 0007 c7ac 0000 0000 0011 ba54 0000 0000 0011 b52c 0000 0000 0011 4c54 0000 0000
0522200 0011 ba34 0000 0000 0011 b9b0 0000 0000 0011 bb34 000a d544 0013 3e44 0013 3e14 0011 bbb4 000a 3018 0000 3277 b464 0000
0522260 0007 ccec 000a 3344 b464 0000 0007 cd20 000a 3350 b464 0000 0007 cd54 0000 0000 0000 3317 b464 0000 0007 cdbc 000a 336c
0522340 b464 0000 0007 cdf0 0000 0000 0011 2ef4 000c eff4 c011 ba94 0000 0000 0000 331f b464 0000 0007 ce24 000a 3398 b464 0000
0522420 0007 ce58 0000 0000 0002 696f 000b 8918 0011 bc50 0000 0000 0000 3387 b464 0000 0007 ce8c 000a 33c4 b464 0000 0007 cec0
0522500 0000 0000 0012 c8ac 0014 12c0 0011 d0ac 000b 411c 0000 33a7 b464 0000 0007 cef4 000a 33f0 b464 0000 0007 cf28 0000 0000
0522560 0000 339f b464 0000 0007 cf5c 000a 340c b464 0000 0007 cf90 0000 0000 000a 4368 0000 0000 000a 4358 000a 3418 0010 b078
0522640 000a 37d0 0004 6e75 6c6c 0000 000a 4388 0000 0000 000a 4378 000a 3438 000a 43b8 0000 0000 000a 4398 000a 3448 0011 b810
0522720 0000 0000 0005 6663 6f73 7400 0010 afc4 000a 266c 000a 4428 000a 3848 000a 4308 0000 0000 000a 42f8 000a 3478 000a 40c8
0523000 0000 0000 000a 40b8 000a 3488 0000 0db7 b464 0000 0007 d4a4 000a 34a8 b464 0000 0007 d4d8 0000 0000 0000 2a77 b464 0000
0523060 0007 e1b4 000a 34c4 b464 0000 0007 e1e8 000a dfd0 000a 34e0 0000 0000 000a 43c8 000a 34d0 0000 2e1f b464 0000 0007 e21c
0523140 000a 34f0 b464 0000 0007 e250 000a e2f0 000a 350c 0000 0000 000a 4458 000a 34fc 0000 2e67 b464 0000 0007 e284 000a 351c
0523220 b464 0000 0007 e2b8 0000 0000 b464 0000 0007 e2ec 000a dae0 0005 616c 6961 7300 0011 3d54 000f 8270 0004 6c6f 6f70 0000
0523300 0011 bb14 000a 32f4 0011 fb14 000a f31c 000a 44b8 0000 0000 000a 44a8 0000 0000 000f 8b08 000a 32b8 000a 45b8 0000 0000
0523360 0000 28a7 b464 0000 0007 ec44 000a 358c b464 0000 0007 ec78 0000 0000 0000 2ecf b464 0000 0007 ecac 000a 35a8 b464 0000
0523440 0007 ece0 0000 0000 000a 3e58 0000 0000 000a 3e48 000a 35b4 000a 3e98 0000 0000 000a 3e88 000a 35c4 000a 3eb8 0000 0000
0523520 000a 3ea8 000a 35d4 000a 3ed8 0000 0000 000a 3ec8 000a 35e4 000a 3ef8 0000 0000 000a 3ee8 000a 35f4 000a 3f18 0000 0000
0523600 000a 3f08 000a 3604 000a 3f38 0000 0000 000a 3f28 000a 3614 000a 3f58 0000 0000 000a 3f48 000a 3624 000a 3f78 0000 0000
0523660 000a 3f68 000a 3634 0000 1ea7 b464 0000 0007 a170 000a 3654 b464 0000 0007 f424 000a 3660 b464 0000 0007 f458 000a 366c
0523740 b464 0000 0007 f48c 000a 3678 b464 0000 0007 f4c0 000a 3684 b464 0000 0007 f4f4 000a 3690 b464 0000 0007 f528 0000 0000
0524020 000a 36ac 0000 0000 000a 4418 000a 369c 0000 2e57 b464 0000 0007 fb30 000a 36bc b464 0000 0007 fb64 0000 0000 0000 2e77
0524100 b464 0000 0007 fb98 000a 36d8 b464 0000 0007 fbcc 0000 0000 000a 36f4 0000 0000 000a 43e8 000a 36e4 0000 2e2f b464 0000
0524160 0007 fc00 000a 3704 b464 0000 0007 fc34 0000 0000 000a 3720 0000 0000 000a 4468 000a 3710 0000 2e6f b464 0000 0007 fc68
0524240 000a 3730 b464 0000 0007 fc9c 0000 0000 0000 296f b464 0000 0007 e180 000a 374c b464 0000 0007 fcd0 0000 0000 000a 41e8
0524320 0000 0000 0010 b244 000e 7cd8 0000 294f b464 0000 0007 e14c 000a 3778 b464 0000 0007 fda0 000a dd00 0010 b014 000a 380c
0524400 0004 6e61 6e64 0000 0000 1dff b464 0000 0007 ff70 000a 37a4 b464 0000 0007 ffa4 000a 37b0 b464 0000 0007 ffd8 000a 37bc
0524460 b464 0000 0008 000c 0000 0000 0003 6e6f 7200 0000 0010 ad58 0000 0000 0000 1df7 b464 0000 0008 0040 000a 37e8 b464 0000
0524540 0008 0074 000a 37f4 b464 0000 0008 00a8 000a 3800 b464 0000 0008 00dc 0000 0000 0010 b000 0000 0000 0000 1e07 b464 0000
0524620 0008 0110 000a 3824 b464 0000 0008 0144 000a 3830 b464 0000 0008 0178 000a 383c b464 0000 0008 01ac 0000 0000 000a 4448
0524700 0000 0000 0011 b990 000a d6e8 0018 b3d0 0019 25b8 0000 3057 b464 0000 0008 0214 000a 3870 b464 0000 0008 0248 0000 0000
0524760 0011 b5b4 0000 0000 0011 b614 0000 0000 0019 7470 0000 0000 000a 38c8 0000 0000 0000 3007 b464 0000 0008 02b0 000a 38ac
0525040 b464 0000 0008 02e4 0000 0000 0012 548c 0000 0000 000a 38d8 0000 0000 0000 0007 b328 0000 0007 d36c 0000 0000 0000 000f
0525120 b328 0000 0007 d304 0000 0000 0000 300f b328 0000 0008 0318 0000 0000 0000 2017 b328 0000 0007 af10 0000 0000 0000 301f
0525200 b328 0000 0007 eb1c 0000 0000 0000 202f b328 0000 0007 af44 0000 0000 0000 203f b328 0000 0007 af78 0000 0000 0000 2047
0525260 b328 0000 0007 afac 0000 0000 0000 204f b328 0000 0007 afe0 0000 0000 0000 205f b328 0000 0007 b07c 0000 0000 0000 305f
0525340 b328 0000 0008 027c 0000 0000 0000 2067 b328 0000 0007 b0b0 0000 0000 0000 3067 b328 0000 0007 c9e0 0000 0000 0000 206f
0525420 b328 0000 0007 b0e4 0000 0000 0000 306f b328 0000 0007 ca14 0000 0000 0000 2077 b328 0000 0007 b118 0000 0000 0000 208f
0525500 b328 0000 0007 b14c 0000 0000 0000 308f b328 0000 0007 a8c4 0000 0000 0000 2097 b328 0000 0007 b180 0000 0000 0000 309f
0525560 b328 0000 0007 ec10 0000 0000 0000 20af b328 0000 0007 b1b4 0000 0000 0000 10df b328 0000 0007 a960 0000 0000 0000 30e7
0525640 b328 0000 0007 ca48 0000 0000 0000 20f7 b464 0000 0007 b1e8 000a d91c 0000 310f b328 0000 0007 ca7c 0000 0000 0000 111f
0525720 b328 0000 0007 a994 0000 0000 0000 211f b328 0000 0007 b21c 0000 0000 0000 312f b328 0000 0007 e4f4 0000 0000 0000 3157
0526000 b328 0000 0007 cab0 0000 0000 0000 315f b328 0000 0007 cae4 0000 0000 0000 2177 b328 0000 0007 b250 0000 0000 0000 3177
0526060 b328 0000 0007 cb18 0000 0000 0000 217f b328 0000 0007 e8a4 0000 0000 0000 317f b328 0000 0007 cb4c 0000 0000 0000 2187
0526140 b328 0000 0007 b284 0000 0000 0000 3187 b328 0000 0007 cb80 0000 0000 0000 318f b328 0000 0007 cbb4 0000 0000 0000 3197
0526220 b328 0000 0007 cbe8 0000 0000 0000 319f b328 0000 0007 cc1c 0000 0000 0000 31a7 b328 0000 0007 cc50 0000 0000 0000 21bf
```

| | | | | | | | | | | | | | | | | | | | | | | | | |
|---|---|---|---|---|---|---|---|---|---|---|---|---|---|---|---|---|---|---|---|---|---|---|---|---|
| 0526300 | b328 | 0000 | 0007 | b2b8 | 0000 | 0000 | 0000 | 21c7 | b328 | 0000 | 0007 | e8d8 | 0000 | 0000 | 0000 | 21ef | b328 | 0000 | 0007 | b2ec | 0000 | 0000 | 0000 | 222f |
| 0526360 | b328 | 0000 | 0007 | b320 | 0000 | 0000 | 0000 | 3237 | b328 | 0000 | 0007 | cc84 | 0000 | 0000 | 0000 | 323f | b328 | 0000 | 0007 | ccb8 | 0000 | 0000 | 0000 | 2257 |
| 0526440 | b328 | 0000 | 0007 | a85c | 0000 | 0000 | 0000 | 225f | b328 | 0000 | 0007 | b354 | 0000 | 0000 | 0000 | 2287 | b464 | 0000 | 0007 | b398 | 000d | d81c | 0000 | 3297 |
| 0526520 | b328 | 0000 | 0007 | a92c | 0000 | 0000 | 0000 | 229f | b328 | 0000 | 0007 | b3bc | 0000 | 0000 | 0000 | 329f | b328 | 0000 | 0007 | a8f8 | 0000 | 0000 | 0000 | 22af |
| 0526600 | b328 | 0000 | 0007 | b3f0 | 0000 | 0000 | 0000 | 32df | b328 | 0000 | 0007 | cd88 | 0000 | 0000 | 0000 | 231f | b328 | 0000 | 0007 | b48c | 0000 | 0000 | 0000 | 2347 |
| 0526660 | b328 | 0000 | 0007 | b4c0 | 0000 | 0000 | 0000 | 2357 | b328 | 0000 | 0007 | b4f4 | 0000 | 0000 | 0000 | 2387 | b328 | 0000 | 0007 | b528 | 0000 | 0000 | 0000 | 23cf |
| 0526740 | b328 | 0000 | 0007 | e388 | 0000 | 0000 | 0000 | 23d7 | b328 | 0000 | 0007 | e3bc | 0000 | 0000 | 0000 | 23df | b328 | 0000 | 0007 | e320 | 0000 | 0000 | 0000 | 240f |
| 0527020 | b328 | 0000 | 0007 | eb40 | 0000 | 0000 | 0000 | 2427 | b328 | 0000 | 0007 | b62c | 0000 | 0000 | 0000 | 24df | b328 | 0000 | 0007 | b6c8 | 0000 | 0000 | 0000 | 2527 |
| 0527100 | b328 | 0000 | 0007 | b5fc | 0000 | 0000 | 0000 | 253f | b328 | 0000 | 0007 | b730 | 0000 | 0000 | 0000 | 255f | b328 | 0000 | 0007 | f130 | 0000 | 0000 | 0000 | 25d7 |
| 0527160 | b328 | 0000 | 0007 | b764 | 0000 | 0000 | 0000 | 2617 | b328 | 0000 | 0007 | b798 | 0000 | 0000 | 0000 | 261f | b328 | 0000 | 0007 | e118 | 0000 | 0000 | 0000 | 2637 |
| 0527240 | b328 | 0000 | 0007 | b7cc | 0000 | 0000 | 0000 | 2657 | b328 | 0000 | 0007 | b800 | 0000 | 0000 | 0000 | 267f | b328 | 0000 | 0007 | a828 | 0000 | 0000 | 0000 | 2687 |
| 0527320 | b328 | 0000 | 0007 | b834 | 0000 | 0000 | 0000 | 268f | b328 | 0000 | 0007 | b868 | 0000 | 0000 | 0000 | 2727 | b464 | 0000 | 0007 | b96c | 000d | 82c0 | 0000 | 177f |
| 0527400 | b328 | 0000 | 0007 | cfc4 | 0000 | 0000 | 0000 | 178f | b328 | 0000 | 0007 | d200 | 0000 | 0000 | 0000 | 278f | b328 | 0000 | 0007 | ba08 | 0000 | 0000 | 0000 | 17a7 |
| 0527460 | b328 | 0000 | 0007 | cff8 | 0000 | 0000 | 0000 | 27cf | b328 | 0000 | 0007 | ba3c | 0000 | 0000 | 0000 | 2817 | b328 | 0000 | 0007 | ba70 | 0000 | 0000 | 0000 | 083f |
| 0527540 | b328 | 0000 | 0007 | d3a0 | 0000 | 0000 | 0000 | 288f | b328 | 0000 | 0007 | bb0c | 0000 | 0000 | 0000 | 2897 | b328 | 0000 | 0007 | bb40 | 0000 | 0000 | 0000 | 28af |
| 0527620 | b328 | 0000 | 0007 | ed14 | 0000 | 0000 | 0000 | 28b7 | b328 | 0000 | 0007 | ed48 | 0000 | 0000 | 0000 | 28bf | b328 | 0000 | 0007 | ed7c | 0000 | 0000 | 0000 | 08c7 |
| 0527700 | b328 | 0000 | 0007 | d540 | 0000 | 0000 | 0000 | 28c7 | b328 | 0000 | 0007 | edb0 | 0000 | 0000 | 0000 | 28cf | b328 | 0000 | 0007 | ede4 | 0000 | 0000 | 0000 | 28d7 |
| 0527760 | b328 | 0000 | 0007 | ee18 | 0000 | 0000 | 0000 | 08df | b328 | 0000 | 0007 | d5a8 | 0000 | 0000 | 0000 | 28df | b328 | 0000 | 0007 | ee4c | 0000 | 0000 | 0000 | 08e7 |
| 0530040 | b328 | 0000 | 0007 | d678 | 0000 | 0000 | 0000 | 28e7 | b328 | 0000 | 0007 | ee80 | 0000 | 0000 | 0000 | 08ef | b328 | 0000 | 0007 | d6ac | 0000 | 0000 | 0000 | 28ef |
| 0530120 | b328 | 0000 | 0007 | eeb4 | 0000 | 0000 | 0000 | 08f7 | b328 | 0000 | 0007 | d610 | 0000 | 0000 | 0000 | 28f7 | b328 | 0000 | 0007 | eee8 | 0000 | 0000 | 0000 | 08ff |
| 0530200 | b328 | 0000 | 0007 | d644 | 0000 | 0000 | 0000 | 28ff | b328 | 0000 | 0007 | ef1c | 0000 | 0000 | 0000 | 0907 | b328 | 0000 | 0007 | d5dc | 0000 | 0000 | 0000 | 2907 |
| 0530260 | b328 | 0000 | 0007 | ef50 | 0000 | 0000 | 0000 | 090f | b328 | 0000 | 0007 | d574 | 0000 | 0000 | 0000 | 290f | b328 | 0000 | 0007 | ef84 | 0000 | 0000 | 0000 | 0917 |
| 0530340 | b328 | 0000 | 0007 | d50c | 0000 | 0000 | 0000 | 2917 | b328 | 0000 | 0007 | efb8 | 0000 | 0000 | 0000 | 291f | b328 | 0000 | 0007 | efec | 0000 | 0000 | 0000 | 2927 |
| 0530420 | b464 | 0000 | 0007 | bb74 | 000d | 4cfc | 0000 | 2957 | b328 | 0000 | 0007 | fd04 | 0000 | 0000 | 0000 | 295f | b328 | 0000 | 0007 | f870 | 0000 | 0000 | 0000 | 2977 |
| 0530500 | b328 | 0000 | 0007 | fd38 | 0000 | 0000 | 0000 | 29bf | b328 | 0000 | 0007 | bdb0 | 0000 | 0000 | 0000 | 29c7 | b328 | 0000 | 0007 | bc10 | 0000 | 0000 | 0000 | 29cf |
| 0530560 | b328 | 0000 | 0007 | bc44 | 0000 | 0000 | 0000 | 29d7 | b328 | 0000 | 0007 | bc78 | 0000 | 0000 | 0000 | 29df | b328 | 0000 | 0007 | bcac | 0000 | 0000 | 0000 | 2a07 |
| 0530640 | b328 | 0000 | 0007 | bce0 | 0000 | 0000 | 0000 | 2a27 | b328 | 0000 | 0007 | bd14 | 0000 | 0000 | 0000 | 2a2f | b328 | 0000 | 0007 | bd48 | 0000 | 0000 | 0000 | 2a3f |
| 0530720 | b328 | 0000 | 0007 | bd7c | 0000 | 0000 | 0000 | 2a57 | b328 | 0000 | 0007 | bde4 | 0000 | 0000 | 0000 | 2a5f | b328 | 0000 | 0007 | be4c | 0000 | 0000 | 0000 | 2a67 |
| 0531000 | b328 | 0000 | 0007 | be18 | 0000 | 0000 | 0000 | 0abf | b328 | 0000 | 0007 | d3d4 | 0000 | 0000 | 0000 | 2ad7 | b328 | 0000 | 0007 | be80 | 0000 | 0000 | 0000 | 0ae7 |
| 0531060 | b328 | 0000 | 0007 | d43c | 0000 | 0000 | 0000 | 2ae7 | b328 | 0000 | 0007 | beb4 | 0000 | 0000 | 0000 | 2aef | b328 | 0000 | 0007 | bee8 | 0000 | 0000 | 0000 | 2b07 |
| 0531140 | b328 | 0000 | 0007 | bf1c | 0000 | 0000 | 0000 | 2b5f | b328 | 0000 | 0007 | bfb8 | 0000 | 0000 | 0000 | 2b6f | b328 | 0000 | 0007 | a890 | 0000 | 0000 | 0000 | 2b77 |
| 0531220 | b328 | 0000 | 0007 | bfec | 0000 | 0000 | 0000 | 2baf | b328 | 0000 | 0007 | c020 | 0000 | 0000 | 0000 | 2bdf | b328 | 0000 | 0007 | f164 | 0000 | 0000 | 0000 | 2c07 |
| 0531300 | b328 | 0000 | 0007 | c124 | 0000 | 0000 | 0000 | 2c0f | b464 | 0000 | 0007 | c158 | 000f | 9aa8 | 0000 | 2c1f | b328 | 0000 | 0007 | eb74 | 0000 | 0000 | 0000 | 2c27 |
| 0531360 | b328 | 0000 | 0007 | e0b0 | 0000 | 0000 | 0000 | 2c37 | b328 | 0000 | 0007 | e0e4 | 0000 | 0000 | 0000 | 2c3f | b328 | 0000 | 0007 | c18c | 0000 | 0000 | 0000 | 1c87 |
| 0531440 | b328 | 0000 | 0007 | aa30 | 0000 | 0000 | 0000 | 1c9f | b328 | 0000 | 0007 | aa64 | 0000 | 0000 | 0000 | 2cdf | b328 | 0000 | 0007 | e354 | 0000 | 0000 | 0000 | 1cef |
| 0531520 | b328 | 0000 | 0007 | aa98 | 0000 | 0000 | 0000 | 2cef | b328 | 0000 | 0007 | fd6c | 0000 | 0000 | 0000 | 2d0f | b328 | 0000 | 0007 | c290 | 0000 | 0000 | 0000 | 2d17 |
| 0531600 | b328 | 0000 | 0007 | c2c4 | 0000 | 0000 | 0000 | 2d1f | b328 | 0000 | 0007 | c2f8 | 0000 | 0000 | 0000 | 2d27 | b328 | 0000 | 0007 | c32c | 0000 | 0000 | 0000 | 1d37 |
| 0531660 | b328 | 0000 | 0007 | f3f0 | 0000 | 0000 | 0000 | 2d3f | b328 | 0000 | 0007 | c360 | 0000 | 0000 | 0000 | 1d4f | b328 | 0000 | 0007 | aacc | 0000 | 0000 | 0000 | 2d4f |
| 0531740 | b464 | 0000 | 0007 | c394 | 0011 | 36a8 | 0000 | 1d67 | b328 | 0000 | 0007 | e870 | 0000 | 0000 | 0000 | 2d77 | b328 | 0000 | 0007 | c430 | 0000 | 0000 | 0000 | 2d87 |
| 0532020 | b328 | 0000 | 0007 | c464 | 0000 | 0000 | 0000 | 1d8f | b328 | 0000 | 0007 | ac38 | 0000 | 0000 | 0000 | 1d9f | b328 | 0000 | 0007 | aca0 | 0000 | 0000 | 0000 | 2d9f |
| 0532100 | b328 | 0000 | 0007 | c498 | 0000 | 0000 | 0000 | 1da7 | b328 | 0000 | 0007 | ac6c | 0000 | 0000 | 0000 | 0daf | b328 | 0000 | 0007 | d338 | 0000 | 0000 | 0000 | 0ddf |
| 0532160 | b328 | 0000 | 0007 | d408 | 0000 | 0000 | 0000 | 2ddf | b328 | 0000 | 0007 | c534 | 0000 | 0000 | 0000 | 0de7 | b328 | 0000 | 0007 | d094 | 0000 | 0000 | 0000 | 1de7 |
| 0532240 | b328 | 0000 | 0007 | acd4 | 0000 | 0000 | 0000 | 0df7 | b328 | 0000 | 0007 | d164 | 0000 | 0000 | 0000 | 0dff | b328 | 0000 | 0007 | d198 | 0000 | 0000 | 0000 | 0e07 |
| 0532320 | b328 | 0000 | 0007 | d02c | 0000 | 0000 | 0000 | 2e07 | b328 | 0000 | 0007 | c568 | 0000 | 0000 | 0000 | 0e0f | b328 | 0000 | 0007 | d0c8 | 0000 | 0000 | 0000 | 2e0f |
| 0532400 | b328 | 0000 | 0007 | c59c | 0000 | 0000 | 0000 | 0e17 | b328 | 0000 | 0007 | d1cc | 0000 | 0000 | 0000 | 1e17 | b328 | 0000 | 0007 | e48c | 0000 | 0000 | 0000 | 2e17 |
| 0532460 | b328 | 0000 | 0007 | c5d0 | 0000 | 0000 | 0000 | 0e1f | b328 | 0000 | 0007 | d060 | 0000 | 0000 | 0000 | 0e27 | b328 | 0000 | 0007 | d0fc | 0000 | 0000 | 0000 | 0e2f |
| 0532540 | b328 | 0000 | 0007 | d130 | 0000 | 0000 | 0000 | 2e37 | b328 | 0000 | 0007 | e458 | 0000 | 0000 | 0000 | 0e47 | b328 | 0000 | 0007 | d470 | 0000 | 0000 | 0000 | 0e57 |
| 0532620 | b328 | 0000 | 0007 | d234 | 0000 | 0000 | 0000 | 0e5f | b328 | 0000 | 0007 | d268 | 0000 | 0000 | 0000 | 1e5f | b328 | 0000 | 0007 | ad08 | 0000 | 0000 | 0000 | 2e5f |
| 0532700 | b328 | 0000 | 0008 | 01e0 | 0000 | 0000 | 0000 | 0e67 | b328 | 0000 | 0007 | d29c | 0000 | 0000 | 0000 | 0e6f | b328 | 0000 | 0007 | d2d0 | 0000 | 0000 | 0000 | 0e7f |
| 0532760 | b328 | 0000 | 0007 | ad3c | 0000 | 0000 | 0000 | 2e97 | b328 | 0000 | 0007 | c604 | 0000 | 0000 | 0000 | 2ea7 | b328 | 0000 | 0007 | c638 | 0000 | 0000 | 0000 | 1eaf |
| 0533040 | b328 | 0000 | 0007 | ea70 | 0000 | 0000 | 0000 | 2eaf | b328 | 0000 | 0007 | c66c | 0000 | 0000 | 0000 | 1ec7 | b328 | 0000 | 0007 | e4c0 | 0000 | 0000 | 0000 | 2edf |
| 0533120 | b328 | 0000 | 0007 | eba8 | 0000 | 0000 | 0000 | 2f1f | b328 | 0000 | 0007 | c708 | 0000 | 0000 | 0000 | 1f47 | b328 | 0000 | 0007 | e3f0 | 0000 | 0000 | 0000 | 1f4f |
| 0533200 | b328 | 0000 | 0007 | e424 | 0000 | 0000 | 0000 | 2f4f | b328 | 0000 | 0007 | c7a4 | 0000 | 0000 | 0000 | 1f67 | b328 | 0000 | 0007 | ada4 | 0000 | 0000 | 0000 | 1f77 |
| 0533260 | b328 | 0000 | 0007 | eaa4 | 0000 | 0000 | 0000 | 1fa7 | b328 | 0000 | 0007 | ae40 | 0000 | 0000 | 0000 | 1fb7 | b328 | 0000 | 0007 | ae74 | 0000 | 0000 | 0000 | 2fb7 |
| 0533340 | b328 | 0000 | 0007 | c840 | 0000 | 0000 | 0000 | 1fc7 | b328 | 0000 | 0007 | aea8 | 0000 | 0000 | 0000 | 1fd7 | b328 | 0000 | 0007 | ead8 | 0000 | 0000 | 0000 | 2fe7 |

| | | | | | | | | | | | | | | | | | | | | | | | | |
|---|---|---|---|---|---|---|---|---|---|---|---|---|---|---|---|---|---|---|---|---|---|---|---|---|
| 0533420 | b328 | 0000 | 0007 | f55c | 0000 | 0000 | 0000 | 2fef | b328 | 0000 | 0007 | c8dc | 0000 | 0000 | 0000 | 1ff7 | b464 | 0000 | 0007 | eb3c | 0014 | 872c | 0000 | 2ff7 |
| 0533500 | b328 | 0000 | 0007 | c910 | 0000 | 0000 | 0000 | 1fff | b328 | 0000 | 0007 | aedc | 0000 | 0000 | 0000 | 2fff | b328 | 0000 | 0007 | c944 | 0000 | 0000 | 5555 | 5555 |
| 0533560 | 0006 | f564 | 0012 | 7364 | 001a | 4850 | 001a | 5d74 | 0000 | 0000 | 000a | 2ad4 | 000a | ecf0 | 001a | 46c8 | 001a | 4450 | 001a | 3c28 | 0000 | 0000 | 001a | 3ecc |
| 0533640 | 0019 | c234 | 0019 | d1f4 | 0019 | d540 | 0019 | d270 | 0000 | 0000 | 000a | a044 | 0000 | 0008 | 000a | a04c | 0000 | 0008 | 0000 | 0000 | 0000 | 0000 | 0002 | 7369 |
| 0533720 | 0000 | 0000 | 0006 | 6573 | 6361 | 7065 | 0000 | 0000 | 0007 | 7065 | 7263 | 656e | 7400 | 0000 | 0000 | 0000 | 8000 | 0024 | 0000 | 0097 | 0000 | 0003 | 0000 | 000d |
| 0534000 | 000a | a0a8 | 000a | a30c | 000a | a3ac | 000a | a3d8 | 0000 | 0000 | 8000 | 0264 | feb8 | 4720 | ffa8 | 2a10 | 0098 | 2920 | 0188 | 0c10 | 0278 | 0b20 | 0371 | 2890 |
| 0534060 | 0461 | 27a0 | 0551 | 0a90 | 0641 | 09a0 | 0730 | ec90 | 078d | 43a0 | 0910 | ce90 | 09ad | bf20 | 0af0 | b090 | 0be0 | afa0 | 0cd9 | cd10 | 0dc0 | 91a0 | 0eb9 | af10 |
| 0534140 | 0fa9 | ae20 | 1099 | 9110 | 1189 | 9020 | 1279 | 7310 | 1369 | 7220 | 1459 | 5510 | 1549 | 5420 | 1639 | 3710 | 1729 | 3620 | 1822 | 5390 | 1909 | 1820 | 1a02 | 3590 |
| 0534220 | 1af2 | 34a0 | 1be2 | 1790 | 1cd2 | 16a0 | 1dc1 | f990 | 1eb1 | f8a0 | 1fa1 | db90 | 2076 | 2b20 | 2181 | bd90 | 2256 | 0d20 | 236a | da10 | 237d | 4f10 | 2435 | ef20 |
| 0534300 | 254a | bc10 | 2615 | d120 | 272a | 9e10 | 27fe | eda0 | 290a | 8010 | 29de | cfa0 | 2aea | 6210 | 2afc | d710 | 2bbe | b1a0 | 2cd3 | 7e90 | 2d9e | 93a0 | 2eb3 | 6090 |
| 0534360 | 2f7e | 75a0 | 3093 | 4290 | 3167 | 9220 | 3273 | 2490 | 3285 | 9990 | 3347 | 7420 | 3453 | 0690 | 3527 | 5620 | 3632 | e890 | 3707 | 3820 | 381c | 0510 | 38e7 | 1a20 |
| 0534440 | 39fb | e710 | 3a0e | 5c10 | 3ac6 | fc20 | 3bdb | c910 | 3cb0 | 19a0 | 3dbb | ab10 | 3e8f | fa30 | 3f9b | 8310 | 406f | dca0 | 4184 | a990 | 418d | e410 | 424f | bea0 |
| 0534520 | 4364 | 8b90 | 442f | a0a0 | 4544 | 6d90 | 460f | 82a0 | 4724 | 4f90 | 47f8 | 9f20 | 4904 | 3190 | 4916 | a690 | 49d8 | 8120 | 4ae4 | 1390 | 4bb8 | 6320 | 4ccd | 3010 |
| 0534600 | 4d98 | 4520 | 4ead | 1210 | 4f78 | 2720 | 508c | f410 | 509f | 6910 | 5161 | 43a0 | 526c | d610 | 5341 | 25a0 | 544c | b810 | 5521 | 07a0 | 562c | 9a10 | 5700 | e9a0 |
| 0534660 | 5815 | b690 | 5828 | 2b90 | 58e0 | cba0 | 59f5 | 9890 | 5ac0 | ada0 | 5bd5 | 7a90 | 5ca9 | ca20 | 5db5 | 5c90 | 5e89 | ac20 | 5f95 | 3e90 | 5fa7 | b390 | 6069 | 8e20 |
| 0534740 | 617e | 5b10 | 6249 | 7020 | 635e | 3d10 | 6429 | 5220 | 653e | 1f10 | 6612 | 6ea0 | 671e | 0110 | 6730 | 7610 | 67f2 | 50a0 | 68fd | e310 | 69d2 | 32a0 | 6add | c510 |
| 0535020 | 6bb2 | 14a0 | 6cc6 | e190 | 6d91 | f6a0 | 6ea6 | c390 | 6eb9 | 3990 | 6f71 | d8a0 | 7086 | a590 | 715a | f520 | 7266 | 8790 | 733a | d720 | 7446 | 6990 | 751a | b920 |
| 0535100 | 762f | 8610 | 7638 | c090 | 76fa | 9b20 | 780f | 6810 | 78da | 7420 | 79ef | 4a10 | 7aba | 5f20 | 7bcf | 2c10 | 7ca3 | 7ba0 | 7daf | 0e10 | 7dc1 | 8310 | 7e83 | 5da0 |
| 0535160 | 7f8e | f010 | 0000 | 0000 | 8000 | 00a0 | 0001 | 0001 | 0001 | 0001 | 0001 | 0001 | 0001 | 0001 | 0601 | 0001 | 0001 | 0001 | 0001 | 0001 | 0001 | 0001 | 0001 | 0001 |
| 0535240 | 0001 | 0002 | 0100 | 0100 | 0100 | 0100 | 0201 | 0001 | 0001 | 0001 | 0002 | 0100 | 0100 | 0100 | 0100 | 0201 | 0001 | 0001 | 0001 | 0002 | 0100 | 0100 | 0100 | 0100 |
| 0535320 | 0201 | 0001 | 0001 | 0001 | 0002 | 0100 | 0100 | 0100 | 0100 | 0201 | 0001 | 0001 | 0001 | 0002 | 0100 | 0100 | 0100 | 0100 | 0201 | 0001 | 0001 | 0001 | 0002 | 0100 |
| 0535400 | 0100 | 0100 | 0100 | 0201 | 0001 | 0001 | 0001 | 0002 | 0100 | 0100 | 0000 | 0000 | 8000 | 002c | ffff | 9d90 | 0000 | 0001 | 0000 | 0000 | ffff | 8f80 | 0000 | 0000 |
| 0535460 | 0000 | 0004 | ffff | 9d90 | 0000 | 0001 | 0000 | 0008 | 0000 | 0000 | 8000 | 0018 | 5044 | 5400 | 5053 | 5400 | 5050 | 4554 | 0000 | 0000 | 0000 | 0060 | 8000 | 003c |
| 0535540 | 2f68 | 6f6d | 652f | 6f73 | 6173 | 322f | 622f | 7175 | 696e | 7475 | 732f | 6269 | 6e32 | 2e35 | 2f73 | 756e | 342d | 342e | 302f | 7072 | 6f77 | 696e | 646f | 7773 |
| 0535620 | 0000 | 0000 | 0016 | 456d | 6163 | 733a | 2f74 | 6d70 | 2f51 | 5072 | 6f6c | 6f67 | 3931 | 3236 | 0000 | 0000 | 0010 | 2f74 | 6d70 | 2f51 | 5072 | 6f6c | 6f67 | 3931 |
| 0535700 | 3236 | 0000 | 0008 | cfac | 0100 | 094f | 0000 | 001f | 0000 | 0004 | 000a | 18f0 | 000a | a4a4 | 0003 | 0000 | 0000 | 0000 | 0000 | 0028 | 000a | a47c | b130 | b66c |
| 0535760 | 0000 | 0001 | 7fff | ffff | 000a | a4a5 | 0200 | 0db5 | 0100 | 094d | 0000 | 3787 | 0000 | 315f | 0000 | 002c | 000a | a4a4 | b4f0 | b4e4 | 0000 | 0000 | 7fff | ffff |
| 0536040 | 000a | a465 | 0000 | 0000 | 0000 | 0001 | 000a | a47c | 0002 | 438a | 000a | a4c8 | 000a | a4cc | 0000 | 3787 | b328 | 0000 | 000a | a490 | 0000 | 0000 | 0015 | 2f68 |
| 0536120 | 6f6d | 652f | 6f73 | 6173 | 322f | 622f | 7175 | 696e | 7475 | 7300 | 0000 | 0028 | 0007 | ff18 | b27c | b66c | 0000 | 0002 | 7fff | ffff | 000b | 417c | 0200 | 0db5 |
| 0536200 | 0100 | 32b5 | 0000 | 3287 | 0000 | 315f | 0000 | 3287 | b328 | 0000 | 000a | a500 | 0000 | 0000 | 0000 | 002c | 000b | 01a8 | b27c | b66c | 0000 | 028e | 7fff | ffff |
| 0536260 | 000c | 2108 | 0200 | 0db5 | 0200 | 2f35 | 0000 | 3e7f | 0000 | 0283 | 0000 | 315f | 2c78 | 0012 | 0002 | 438a | 4e1c | 0000 | 0000 | 403f | 228c | 0008 | 0000 | 002c |
| 0536340 | 0007 | e5a8 | b27c | b66c | 0000 | 0003 | 7fff | ffff | 000a | a5e0 | 0200 | 0db5 | 0200 | 2255 | 0000 | 2cb7 | 0000 | 378f | 0000 | 315f | 0000 | 002c | 000a | a5a0 |
| 0536420 | b4f0 | b4e4 | 0000 | 0002 | 7fff | ffff | 0008 | bf5d | 0000 | 001c | 0000 | 0007 | 000a | aa64 | 0002 | 438a | 000a | 1e7c | 000a | ed60 | 0000 | 2cb7 | b328 | 0000 |
| 0536500 | 000a | a578 | 0000 | 0000 | 0000 | 002c | 000a | a574 | b27c | b66c | 0000 | 0004 | 7fff | ffff | 000a | a660 | 0200 | 0db5 | 0200 | 2255 | 0000 | 2daf | 0000 | 06df |
| 0536560 | 0000 | 315f | 0000 | 2daf | b464 | 0000 | 000a | aa68 | 000a | aa8c | 000a | a5c8 | 0000 | 0000 | 0008 | 7375 | 6e34 | 2d34 | 2e30 | 0000 | 0003 | 322e | 3500 | 0000 |
| 0536640 | 0010 | 5375 | 6e2d | 342c | 2053 | 756e | 4f53 | 2034 | 2e30 | 0000 | 0006 | 7375 | 6e34 | 2d34 | 0000 | 0000 | 0004 | 7375 | 6e34 | 0000 | 0000 | 002c | 000a | a5e0 |
| 0536720 | b27c | b66c | 0000 | 0005 | 7fff | ffff | 000a | a6b4 | 0200 | 0db5 | 0200 | 2255 | 0000 | 3037 | 0000 | 3797 | 0000 | 315f | 0000 | 3037 | b464 | 0000 | 000a | a664 |
| 0537000 | 000a | a6d8 | 0000 | 2677 | b328 | a7bd | 000a | a850 | 0000 | 0000 | 000a | a684 | 000a | a614 | 0000 | 002c | 000a | a660 | b27c | b66c | 0000 | 0006 | 7fff | ffff |
| 0537060 | 000a | a6ec | 0200 | 0db5 | 0200 | 2255 | 0000 | 3037 | 0000 | 37af | 0000 | 315f | b464 | 0000 | 000a | a6b8 | 000a | a710 | 0000 | 002c | 000a | a6b4 | b27c | b66c |
| 0537140 | 0000 | 0007 | 7fff | ffff | 000a | a724 | 0200 | 0db5 | 0200 | 2255 | 0000 | 3037 | 0000 | 37b7 | 0000 | 315f | b464 | 0000 | 000a | a6f0 | 000a | a748 | 0000 | 002c |
| 0537220 | 000a | a6ec | b27c | b66c | 0000 | 0008 | 7fff | ffff | 000a | a77c | 0200 | 0db5 | 0200 | 2255 | 0000 | 3037 | 0000 | 06df | 0000 | 315f | b464 | 0000 | 000a | a728 |
| 0537300 | 0000 | 0000 | 0004 | 7132 | 2e35 | 0000 | 0014 | 6765 | 6e65 | 7269 | 632f | 7132 | 2e35 | 2f69 | 656c | 7073 | 7973 | 0000 | 0000 | 0030 | 000a | a724 | b27c | b66c |
| 0537360 | 0000 | 0009 | 7fff | ffff | 000a | a7ec | 0200 | 0db5 | 0200 | 2255 | 0000 | 244f | 0100 | 2cb5 | 0000 | 37c7 | 0000 | 315f | 0000 | 244f | b464 | 0000 | 0007 | e6cc |
| 0537440 | 000a | aa14 | 000a | a604 | 0000 | 0000 | 000a | a814 | 000a | a7b4 | 0008 | 7170 | 6c69 | 6232 | 2e35 | 0000 | 0010 | 6765 | 6e65 | 7269 | 632f | 7170 | 6c69 | 6232 |
| 0537520 | 2e35 | 0000 | 0000 | 0030 | 000a | a77c | b27c | b66c | 0000 | 000a | 7fff | ffff | 000a | a84c | 0200 | 0db5 | 0200 | 2255 | 0000 | 2caf | 0100 | 2cb5 | 0000 | 37d7 |
| 0537600 | 0000 | 315f | 0000 | 2caf | b328 | 0000 | 000a | a7f0 | 0000 | 0000 | ffff | ffff | 0100 | 267f | 0000 | 3287 | 0000 | 0004 | 000a | 18f0 | 000a | a8b8 | 0003 | 0000 |
| 0537660 | 0000 | 0000 | 0000 | 0030 | 000a | a7ec | b27c | b66c | 0000 | 000b | 7fff | ffff | 000a | a5a1 | 0200 | 0db5 | 0200 | 2255 | 0000 | 2677 | 0000 | 000c | 0200 | 095d |
| 0537740 | 0055 | 41a3 | 0100 | 267d | 0000 | 000e | 000a | a694 | 000a | a6a4 | 0000 | 002c | 0007 | e57c | b27c | b66c | 0000 | 000c | 7fff | ffff | 000a | a8f4 | 0200 | 0db5 |
| 0540020 | 0100 | 267d | 0100 | 2cad | 0000 | 2677 | 0000 | 315f | 0000 | 002c | 000a | a8b8 | b4f0 | b4e4 | 0000 | 000b | 7fff | ffff | 000a | a835 | 0000 | 0004 | 0000 | 0002 |
| 0540100 | 0007 | e57c | 0002 | 438a | 000a | a9cc | 0100 | 2caf | b464 | 0000 | 000a | a890 | 000a | a918 | 0000 | 002c | 000a | a88c | b27c | b66c | 0000 | 000d | 7fff | ffff |
| 0540160 | 000a | a8b9 | 0200 | 0db5 | 0100 | 267d | 0100 | 2cad | 0000 | 30ff | 0000 | 315f | b464 | 0000 | 000a | a8f8 | 0000 | 0000 | 0008 | b50c | 0000 | 2dff | 0000 | 001f |
| 0540240 | 0000 | 0000 | 000a | 18f0 | 000a | a94c | 0003 | 0000 | 0000 | 0000 | 0000 | 0024 | 000a | a94c | b0f8 | b66c | 0000 | 000e | 7fff | ffff | 000a | a935 | 0200 | 0db5 |
| 0540320 | 0000 | 2dff | 0000 | 315f | b464 | 0000 | 0007 | e5ac | 0000 | 0000 | 0008 | c08c | 0100 | 32af | 0000 | 001f | 0000 | 0004 | 000a | 19f0 | 0007 | e550 | 0003 | 0000 |
| 0540400 | 0000 | 0000 | 0000 | 0028 | 000a | a99c | b130 | b66c | 0000 | 0010 | 7fff | ffff | 0007 | e551 | 0200 | 0db5 | 0100 | 32ad | 0000 | 1597 | 0000 | 315f | 0100 | 2cb7 |
| 0540460 | b328 | 0000 | 0007 | e580 | 0000 | 0000 | 000a | a9bc | 000a | a8dc | 0000 | 20a7 | b464 | 0000 | 0007 | e69c | 000a | aa08 | b464 | 0000 | 0007 | e5dc | 000a | a968 |

```
0540540  b464 0000 0007 e60c 000a a9e4 b464 0000 0007 e63c 000a a9f0 b464 0000 0007 e66c 000a a9fc b464 0000 000a a780 0000 0000
0540620  0000 0030 000a aa64 b27c b66c 0000 0019 7fff ffff 0007 e6c8 0200 0db5 0200 2255 0000 2daf 0100 2cb5 0000 2c9f 0000 315f
0540700  b464 0000 000a a5e4 0000 0000 0000 0030 000a a84c b27c b66c 0000 001a 7fff ffff 000a aa28 0200 04b5 0200 2255 0000 2daf
0540760  0100 20a5 0000 06df 0000 315f b464 0000 000a aa2c 000a aa50 0000 002c 000b 166c b27c b66c 0000 0072 7fff ffff 000a e82c
0541040  0200 0db5 0200 24bd 0000 38c7 0000 1ea7 0000 315f 000b 4360 0000 0e4f b328 0000 000a e4fc 0000 0000 0013 2f68 6f6d 652f
0541120  6f73 6173 312f 612f 7669 6a61 7900 0000 001e 2f68 6f6d 652f 6f73 6173 312f 612f 7669 6a61 792f 7072 6f6c 6f67 2e69 6e69
0541200  0000 0000 0000 0028 000a ab1c b130 b66c 0000 001c 7fff ffff 0007 e525 0200 0db5 0100 31b5 0000 3287 0000 315f 0000 3287
0541260  b328 0000 000a ab20 0000 0000 0003 7275 6e00 0000 0000 0000 8000 0410 8217 0000 0001 f011 2f68 6f6d 652f 6f73 6173 312f
0541340  612f 7669 6a61 792f 5648 444c 2f70 6172 7365 722f 7072 6f6c 6f67 2f6e 6577 6e65 772f 7633 2e31 0000 0000 0000 0000 0000
0541420  0000 0000 0000 0000 0000 0000 0000 0000 0000 0000 0000 0000 0000 0000 0000 0000 0000 0000 0000 0000 0000 0000 0000 0000
*
0543320  0000 0000 0008 da8c 0200 1d37 0000 3287 0000 0008 000b 1474 000b 1474 0041 0000 0000 0000 0036 2f68 6f6d 652f 6f73 6173
0543400  312f 612f 7669 6a61 792f 5648 444c 2f70 6172 7365 722f 7072 6f6c 6f67 2f6e 6577 6e65 772f 7633 2e31 2f72 756e 0066 6f75
0543460  0039 2f68 6f6d 652f 6f73 6173 312f 612f 7669 6a61 792f 5648 444c 2f70 6172 7365 722f 7072 6f6c 6f67 2f6e 6577 6e65 772f
0543540  7633 2e31 2f72 756e 2e70 6c00 000a d0d4 0000 2008 2525 2525 2525 2525 2525 2525 2525 2525 2525 2525 2525 2525 2525 2525
0543620  2525 2525 2525 2525 2525 2525 2525 2525 2525 2525 2525 2525 2525 2525 2525 2525 2525 2525 2525 2525 2525 2525 2525 2525
0543700  2525 0a25 2525 2520 200a 2525 2525 2020 5265 6164 2061 6e64 2070 726f 6365 7373 2061 2056 4844 4c20 6669 6c65 2e0a 2525
0543760  2525 0a25 2525 2525 2525 2525 2525 2525 2525 2525 2525 2525 2525 2525 2525 2525 2525 2525 2525 2525 2525 2525 2525 2525
0544040  2525 2525 2525 2525 2525 2525 2525 2525 2525 2525 2525 2525 2525 2525 2525 2525 250a 3a2d 2065 6e73 7572 655f 6c6f 6164
0544120  6564 285b 7072 6f77 696e 646f 7773 5f75 7469 6c73 5d29 2e20 2020 2020 2020 2020 2020 2520 7072 6f77 696e 646f 7773 2075
0544200  7469 6c69 7469 6573 0a3a 2d20 656e 7375 7265 5f6c 6f61 6465 6428 5b70 726f 7461 6c6b 2c70 726f 7461 6c6b 5f75 7469 6c73
0544260  5d29 2e20 2020 2020 2025 2070 726f 7461 6c6b 206d 6f64 6966 6965 6420 6c6f 6361 6c6c 790a 0a25 2525 2520 4c6f 6164 206c
0544340  6962 7261 7269 6573 0a0a 3a2d 2065 6e73 7572 655f 6c6f 6164 6564 285b 6c69 6272 6172 7928 6261 7369 6373 295d 292e 0a3a
0544420  2d20 656e 7375 7265 5f6c 6f61 6465 6428 5b6c 6962 7261 7279 2863 7479 7065 7329 2c20 6c69 6272 6172 7928 6c69 6e65 696f
0544500  292c 206c 6962 7261 7279 2866 696c 6573 295d 292e 0a3a 2d20 656e 7375 7265 5f6c 6f61 6465 6428 5b6c 6962 7261 7279 286c
0544560  6973 7473 292c 206c 6962 7261 7279 2873 6574 7329 2c20 6c69 6272 6172 7928 6669 6e64 616c 6c29 5d29 2e0a 3a2d 2065 6e73
0544640  7572 655f 6c6f 6164 6564 285b 6c69 6272 6172 7928 666c 6174 7465 6e29 5d29 2e0a 3a2d 2065 6e73 7572 655f 6c6f 6164 6564
0544720  285b 6c69 6272 6172 7928 6374 7229 5d29 2e0a 3a2d 2065 6e73 7572 655f 6c6f 6164 6564 285b 6c69 6272 6172 7928 6d61 7468
0545000  295d 292e 0a3a 2d20 656e 7375 7265 5f6c 6f61 6465 6428 5b6c 6962 7261 7279 2867 7261 7068 7329 2c20 6c69 6272 6172 7928
0545060  6173 7429 5d29 2e0a 0a25 2525 2520 4c6f 6164 206c 6f63 616c 2066 696c 6573 0a3a 2d20 656e 7375 7265 5f6c 6f61 6465 6428
0545140  5b67 7261 7068 735d 292e 0909 0925 2061 7578 696c 6c69 6172 7920 6465 666e 7320 666f 7220 6772 6170 6873 0a3a 2d20 656e
0545220  7375 7265 5f6c 6f61 6465 6428 5b6c 6973 7473 5f61 6e64 5f73 6574 735d 292e 0909 2520 6164 6469 7469 6f6e 616c 2075 7469
0545300  6c69 7469 6573 0a3a 2d20 656e 7375 7265 5f6c 6f61 6465 6428 5b72 6561 6463 6f6e 7374 5d29 2e09 0909 2520 6d6f 6469 6669
0545360  6564 206c 6962 7261 7279 2066 696c 650a 3a2d 2065 6e73 7572 655f 6c6f 6164 6564 285b 7265 7365 7276 6564 2c20 6c65 782c
0545440  2076 6864 6c5d 292e 0925 2076 6864 6c20 6772 616d 6d61 722c 6c65 7869 6361 6c20 616e 616c 797a 6572 0a3a 2d20 656e 7375
0545520  7265 5f6c 6f61 6465 6428 5b63 6f75 6e74 6572 735d 292e 0909 0925 2067 6c6f 6261 6c20 636f 756e 7465 7273 0a0a 3a2d 2065
0545600  6e73 7572 655f 6c6f 6164 6564 285b 6164 6463 6c61 7573 6573 2c20 6765 6e65 7269 635f 7574 696c 732c 2075 7469 6c73 5d29
0545660  2e20 2520 7668 646c 2063 6f6d 7069 6c65 720a 3a2d 2065 6e73 7572 655f 6c6f 6164 6564 285b 6461 7461 7374 7275 6374 7572
0545740  652c 2064 6174 6162 6173 652c 2073 7461 636b 2c20 616c 6961 7365 735d 292e 2025 2020 6461 7461 6261 7365 0a3a 2d20 656e
0546020  7375 7265 5f6c 6f61 6465 6428 5b73 6368 6564 756c 655d 292e 0909 0925 206f 7065 7261 746f 7220 7363 6865 6475 6c69 6e67
0546100  090a 3a2d 2065 6e73 7572 655f 6c6f 6164 6564 285b 636c 7573 7465 722c 2063 6c75 7374 6572 5f73 7570 706f 7274 2c20 6663
0546160  6f73 745d 292e 2025 2063 6c75 7374 6572 596e 670a 3a2d 2065 6e73 7572 655f 6c6f 6164 6564 285b 6275 642c 2061 7061 7274
0546240  795d 292e 0909 2520 6865 7572 6973 7469 6373 2066 6f72 2063 6c75 7374 6572 696e 670a 3a2d 2065 6e73 7572 655f 6c6f 6164
0546320  6564 285b 6573 7469 6d61 746f 722c 2063 6869 7073 697a 6572 2c20 6675 6e69 7473 5d29 2e20 2520 6465 7369 676e 2073 697a
0546400  6520 6573 7469 6d61 746f 720a 3a2d 2065 6e73 7572 655f 6c6f 6164 6564 285b 6573 7469 6d61 7465 735d 292e 0909 0925 2064
0546460  6973 706c 6179 2073 697a 6520 6573 7469 6d61 7465 733a 3a2d 2065 6e73 7572 655f 6c6f 6164 6564 285b 6473 705d 292e 0909
0546540  0925 2064 6174 6120 7061 7468 2073 796e 7468 6573 6973 0a3a 2d20 656e 7375 7265 5f6c 6f61 6465 6428 5b73 796e 6f70 7379
0546620  735d 292e 0909 0925 206f 7468 6572 2073 796e 7468 6573 6973 2074 6f6f 6c73 0a3a 2d20 656e 7375 7265 5f6c 6f61 6465 6428
0546700  5b6c 6273 2c6c 7665 725d 292e 0909 0925 204d 4445 2074 6f6f 6c73 0a3a 2d20 656e 7375 7265 5f6c 6f61 6465 6428 5b63 6d6f
0546760  7331 306b 5d29 2e09 0909 2520 6c69 6272 6172 7920 2875 6e64 6572 2064 6576 656c 6f70 6d65 6e74 290a 3a2d 2065 6e73 7572
0547040  655f 6c6f 6164 6564 285b 7265 6164 6669 6c65 5d29 2e09 0909 2520 666f 7220 6368 6970 7369 7a65 722c 2073 796e 6f70 7379
0547120  732c 2064 7370 0a3a 2d20 656e 7375 7265 5f6c 6f61 6465 6428 5b64 6562 7567 5d29 2e09 0909 2520 7072 6564 6963 6174 6573
0547200  2066 6f72 2064 6562 7567 6769 6e67 0a3a 2d20 656e 7375 7265 5f6c 6f61 6465 6428 5b73 6368 656d 6174 6963 735d 292e 0909
0547260  2020 2020 2020 2020 2520 7363 6865 6d61 7469 6373 2f62 6c6f 636b 2064 6961 6772 616d 0a3a 2d20 656e 7375 7265 5f6c 6f61
0547340  6465 6428 5b6f 626a 6563 7473 5d29 2e09 0909 2520 746f 706c 6576 656c 206f 626a 6563 7473 0a3a 2d20 656e 7375 7265 5f6c
```

```
0547420 6f61 6465 6428 5b77 7269 7465 5f76 6864 6c2c 7274 6c5d 292e 2020 2020 2020 2020 2020 2020 2025 2077 7269 7465 2076 6864
0547500 6c20 6f75 7470 7574 0a3a 2d20 656e 7375 7265 5f6c 6f61 6465 6428 5b63 6f6d 706f 6e65 6e74 735d 292e 2020 2020 2020 2020
0547560 2020 2020 2020 2020 2025 2063 6f6d 706f 6e65 6e74 7320 6c69 6272 6172 790a 0a25 2525 2520 5370 6563 6961 6c20 6669 6c65
0547640 730a 0a3a 2d20 656e 7375 7265 5f6c 6f61 6465 6428 5b72 746c 685d 292e 2020 2020 2020 2020 2020 2020 2020 2020 2020 2020
0547720 2020 2025 2066 6f72 2068 616c 312e 7668 646c 0a3a 2d20 656e 7375 7265 5f6c 6f61 6465 6428 5b68 616c 315f 636f 6e73 7472
0550000 6169 6e65 645d 292e 2020 2020 2020 2020 2020 2025 2066 6f72 2068 616c 312e 7668 646c 0a0a 2525 2525 2525 2525 2525 2525
0550060 2525 2525 2525 2525 2525 2525 2525 2525 2525 2525 2525 2525 2525 2525 2525 2525 2525 2525 2525 2525 2525 2525 2525 2525
0550140 2525 2525 2525 2525 2525 2525 2525 2525 2525 0a25 2525 2520 436f 6d70 696c 6520 5648 444c 2066 696c 650a 0a63 6f6d 7069
0550220 6c65 5f76 6864 6c28 4669 6c65 6e61 6d65 2920 3a2d 0a09 636c 6561 722c 0a09 6e65 775f 7668 646c 5f66 696c 6528 4669 6c65
0550300 6e61 6d65 2c20 5648 444c 4669 6c65 292c 0a09 7265 6164 6669 6c65 2856 4844 4c46 696c 652c 2057 292c 0a09 7068 7261 7365
0550360 2876 6864 6c5f 6f6b 7328 5429 2c20 5729 2c0a 0970 7574 6462 5f65 6e74 6974 795f 6465 636c 6172 6174 696f 6e28 7465 7374
0550440 292c 7075 7464 625f 656e 645f 656e 7469 7479 5f64 6563 6c61 7261 7469 6f6e 2c0a 0970 6872 6173 6528 6172 6368 6974 6563
0550520 7475 7265 5f62 6f64 792c 2054 292e 0a0a 6e65 775f 7668 646c 5f66 696c 6528 4669 6c65 6e61 6d65 2920 3a2d 0a09 6e65 775f
0550600 7668 646c 5f66 696c 6528 4669 6c65 6e61 6d65 2c20 5f29 2e0a 090a 6e65 775f 7668 646c 5f66 696c 6528 4669 6c65 6e61 6d65
0550660 2c20 5648 444c 4669 6c65 2920 3a2d 0a09 7668 646c 5f66 696c 6528 4669 6c65 6e61 6d65 2c20 5648 444c 4669 6c65 292c 0a09
0550740 2866 696c 655f 6578 6973 7473 2856 4844 4c46 696c 6529 3b66 6f72 6d61 7428 2743 616e 6e6f 7420 6669 6e64 2066 696c 6520
0551020 227e 6122 2e7e 6e27 2c20 5b56 4844 4c46 696c 655d 2929 2c0a 0928 7265 7472 6163 7428 7668 646c 5f66 696c 6528 5f29 2920
0551100 2d3e 2074 7275 653b 2074 7275 6529 2c0a 0970 7574 6462 2876 6864 6c5f 6669 6c65 2856 4844 4c46 696c 6529 292e 0a09 0a25
0551160 2020 2076 6864 6c5f 6669 6c65 2846 696c 652c 2056 4844 4c46 696c 6529 0a25 2020 2054 7269 6573 2061 6c6c 206b 6e6f 776e
0551240 2065 7874 656e 7369 6f6e 7320 746f 2073 6565 2069 6620 616e 7920 7375 6368 2066 696c 6520 6578 6973 7473 2e0a 2520 2020
0551320 5265 7475 726e 7320 7361 6d65 2066 696c 6520 6e61 6d65 206f 6e20 6661 696c 7572 652e 0a0a 7668 646c 5f66 696c 6528 4669
0551400 6c65 2c20 5648 444c 4669 6c65 2920 3a2d 0a09 6174 6f6d 2846 696c 6529 2c0a 096e 616d 6528 4669 6c65 2c20 4368 6172 7329
0551460 2c0a 096d 656d 6265 7228 4578 7465 6e73 696f 6e2c 205b 2222 2c20 222e 7668 646c 222c 2022 2e56 4844 4c22 5d29 2c0a 0961
0551540 7070 656e 6428 4368 6172 732c 2045 7874 656e 7369 6f6e 2c20 5648 444c 4368 6172 7329 2c0a 096e 616d 6528 5648 444c 4669
0551620 6c65 2c20 5648 444c 4368 6172 7329 2c0a 0966 696c 655f 6578 6973 7473 2856 4844 4c46 696c 6529 2c20 212e 0a76 6864 6c5f
0551700 6669 6c65 2846 696c 652c 2046 696c 6529 203a 2120 212e 0a0a 0a25 2020 2072 6561 6466 696c 6528 4669 6c65 6e61 6d65 2c20
0551760 4368 6172 7329 0a0a 7265 6164 6669 6c65 2846 696c 656e 616d 652c 2043 6861 7273 2920 3a2d 0a09 0973 6565 2846 696c 656e
0552040 616d 6529 2c20 6765 745f 6368 6172 7328 4368 6172 7329 2c20 7365 656e 2e0a 0a25 2020 2067 6574 5f63 6861 7273 2843 6861
0552120 7273 290a 2520 2020 7265 6164 7320 616c 6c20 7468 6520 6368 6172 6163 7465 7273 2066 726f 6d20 7468 6520 6375 7272 656e
0552200 7420 696e 7075 7420 7374 7265 616d 2061 6e64 2072 6574 7572 6e73 200a 2520 2020 6120 6c69 7374 206f 6620 4368 6172 7320
0552260 696e 636c 7564 696e 6720 7468 6520 7465 726d 696e 6174 696e 6720 656e 645f 6f66 5f66 696c 6520 6368 6172 6163 7465 722e
0552340 0a0a 6765 745f 6368 6172 7328 4368 6172 7329 203a 2d0a 0967 6574 3028 4368 292c 0a09 6765 745f 6368 6172 7328 4368 2c20
0552420 4368 6172 7329 2e0a 0a67 6574 5f63 6861 7273 2843 682c 2043 6861 7273 2920 3a2d 0a09 6973 5f65 6e64 6669 6c65 2843 6829
0552500 2c0a 0921 2c0a 0943 6861 7273 203d 205b 4368 5d2e 0a67 6574 5f63 6861 7273 2843 682c 205b 4368 7c43 6861 7273 5d29 203a
0552560 2d0a 0967 6574 3028 4e65 7874 292c 0a09 6765 745f 6368 6172 7328 4e65 7874 2c20 4368 6172 7329 2e0a 0a25 2525 2525 2525
0552640 2525 2525 2525 2525 2525 2525 2525 2525 2525 2525 2525 2525 2525 2525 2525 2525 2525 2525 2525 2525 2525 2525 2525 2525
0552720 2525 2525 2525 2525 2525 2525 2525 2525 2525 2525 2525 250a 2525 2525 204d 6973 6320 7072 6f63 6564 7572 6573 0a0a 6e65
0553000 775f 6465 7369 676e 2844 6573 6967 6e29 203a 2d0a 0970 7574 6462 5f64 6573 6967 6e28 5f2c 2044 6573 6967 6e29 2e0a 0a63
0553060 6c65 6172 203a 2d0a 0963 6c65 6172 5f76 6864 6c5f 6669 6c65 2c0a 0963 6c65 6172 5f64 6174 6162 6173 652c 0a09 636c 6561
0553140 725f 7374 6163 6b2c 0a09 7265 7365 745f 636f 756e 7465 7273 2e0a 0a63 6c65 6172 5f76 6864 6c5f 6669 6c65 203a 2d0a 0972
0553220 6574 7261 6374 616c 6c28 7668 646c 5f66 696c 6528 5f29 292e 0a0a 636c 6561 725f 7374 6163 6b20 3a2d 0a09 7265 7472 6163
0553300 7461 6c6c 2863 7572 7265 6e74 235f 2c5f 2929 2e0a 0a63 6c65 6172 5f64 6174 6162 6173 6520 3a2d 0a09 636c 6561 725f 6461
0553360 7461 7374 7275 6374 7572 655f 656c 656d 656e 7473 2c09 0925 2069 6e20 6669 6c65 2064 6174 6173 7472 7563 7475 7265 2e70
0553440 6c0a 0963 6c65 6172 5f73 6368 6564 756c 6573 2c0a 0963 6c65 6172 5f64 6667 2c0a 2509 636c 6561 725f 636c 7573 7465 725f
0553520 656c 656d 656e 7473 2c0a 0963 6c65 6172 5f65 7374 696d 6174 6573 2e0a 0a63 6c65 6172 5f73 6368 6564 756c 6573 203a 2d0a
0553600 0972 6574 7261 6374 616c 6c28 6173 6170 5f63 6f6e 7472 6f6c 5f73 7465 7073 285f 2c5f 2929 2c0a 0972 6574 7261 6374 616c
0553660 6c28 6173 6170 5f73 6368 6564 756c 6528 5f2c 5f2c 5f29 292c 0a09 7265 7472 6163 7461 6c6c 2861 6c61 705f 7363 6865 6475
0553740 6c65 285f 2c5f 2c5f 2929 2e0a 0a63 6c65 6172 5f64 6667 203a 2d0a 0972 6574 7261 6374 616c 6c28 6466 6728 5f2c 5f2c 5f2c
0554020 5f2c 5f2c 5f29 292e 0a09 0a63 6c65 6172 5f63 6c75 7374 6572 5f65 6c65 6d65 6e74 7320 3a2d 0a09 636c 6561 725f 6469 7374
0554100 616e 6365 2c0a 0972 6574 7261 6374 616c 6c28 636c 7573 7465 7273 285f 2929 2c0a 0972 6574 7261 6374 616c 6c28 6465 7369
0554160 676e 285f 2929 2e0a 090a 636c 6561 725f 6469 7374 616e 6365 203a 2d0a 0972 6574 7261 6374 616c 6c28 6469 7374 616e 6365
0554240 285f 2c5f 2c5f 2929 2e0a 0a72 6573 6574 5f63 6f75 6e74 6572 7320 3a2d 0a09 696e 6974 5f63 6f75 6e74 2865 6e74 6974 7929
0554320 2c0a 0969 6e69 745f 636f 756e 7428 6172 6368 6974 6563 7475 7265 292c 0a09 696e 6974 5f63 6f75 6e74 2863 6f6e 7374 616e
0554400 7429 2c0a 0969 6e69 745f 636f 756e 7428 7661 7269 6162 6c65 292c 0a09 696e 6974 5f63 6f75 6e74 286f 7065 7261 746f 7229
0554460 2c0a 0969 6e69 745f 636f 756e 7428 696f 292c 0a09 696e 6974 5f63 6f75 6e74 286f 7574 7075 7429 2c0a 0969 6e69 745f 636f
```

```
0554540 756e 7428 7072 6f63 626f 6479 292c 0a09 696e 6974 5f63 6f75 6e74 2862 7261 6e63 6829 2c0a 0969 6e69 745f 636f 756e 7428
0554620 7072 6f63 6573 7329 2c0a 0969 6e69 745f 636f 756e 7428 7072 6f63 6564 7572 6529 2c0a 0969 6e69 745f 636f 756e 7428 6675
0554700 6e63 7469 6f6e 292c 0a09 696e 6974 5f63 6f75 6e74 2873 7461 7465 626c 6f63 6b29 2c0a 0969 6e69 745f 636f 756e 7428 6465
0554760 7369 676e 292c 0a09 696e 6974 5f63 6f75 6e74 286c 696e 6529 2c0a 0969 6e69 745f 636f 756e 7428 696e 7465 726d 6564 6961
0555040 7465 292e 0a0a 2525 2525 2525 2525 2525 2525 2525 2525 2525 2525 2525 2525 2525 2525 2525 2525 2525 2525 2525 2525 2525
0555120 2525 2525 2525 2525 2525 2525 2525 2525 2525 2525 2525 2525 2525 2525 2525 2525 2525 2525 0a25 2525 2520 4350 5520 5374
0555200 6174 6973 7469 6373 0a0a 6765 745f 6370 755f 7469 6d65 2854 2920 3a2d 0a09 7374 6174 6973 7469 6373 2872 756e 7469 6d65
0555260 2c5b 542c 5f5d 292e 202f 2a20 5175 696e 7475 7320 5072 6f6c 6f67 2076 6572 7369 6f6e 202a 2f0a 0a63 7075 2854 6572 6d29
0555340 203a 2d0a 0967 6574 5f63 7075 5f74 696d 6528 5430 292c 0a09 6361 6c6c 2854 6572 6d29 2c0a 0967 6574 5f63 7075 5f74 696d
0555420 6528 5431 292c 0a09 7265 706f 7274 2854 302c 5431 292e 0a0a 7265 706f 7274 2854 302c 2054 3129 203a 2d0a 0943 5055 7469
0555500 6165 2069 7320 2854 312d 5430 292f 3130 3030 2c0a 096e 6c2c 6e6c 2c0a 0977 7269 7465 2827 2a2a 2a2a 2a2a 2a2a 2a2a 2a2a
0555560 2a2a 2a2a 2a2a 2a2a 2a2a 2a2a 2a2a 2729 2c6e 6c2c 0a09 666f 726d 6174 2827 2043 5055 2054 494d 4520 3d20 7e66 2073 6563
0555640 737e 6e27 2c20 4350 5574 696d 6529 2c0a 0977 7269 7465 2827 2a2a 2a2a 2a2a 2a2a 2a2a 2a2a 2a2a 2a2a 2a2a 2a2a 2a2a 2a2a
0555720 2a2a 2729 2c6e 6c2c 6e6c 2e0a 0a0a 2525 2525 2525 2525 2525 2525 2525 2525 2525 2525 2525 2525 2525 2525 2525 2525 2525
0556000 2525 2525 2525 2525 2525 2525 2525 2525 2525 2525 2525 2525 2525 2525 2525 2525 2525 2525 2525 2525 2525 2525 0a00 038b
0556060 000a c4c6 0000 0383 000a c4ce 0000 0363 000a c4d6 0000 034b 000a c4de 0000 0313 000a c4e6 0000 0193 000a c4ee 0000 0173
0556140 000a c4f6 0000 01ab 0000 0007 0000 033b 000a c506 0000 032b 000a c50e 0000 0373 000a c516 0000 032b 000a c51e 0000 0393
0556220 000a c526 0000 034b 000a c52e 0000 031b 0000 0007 0000 033b 000a c53e 0000 032b 000a c546 0000 0373 000a c54e 0000 032b
0556300 000a c556 0000 0393 000a c55e 0000 034b 000a c566 0000 031b 000a c4b6 0100 2cb7 0000 37d7 0200 2257 0000 2caf 000a c56d
0556360 0200 0ad7 0000 3287 0000 0007 0200 0db7 000a c575 0000 315f 0055 2d03 0100 2167 0055 2d03 0200 2257 0000 2677 000a c5ac
0556440 0100 267f 000a c5ac 0200 0db7 000a c5a5 000a c5b1 0200 0ad7 0000 3287 0000 0007 0200 095f 0055 41a3 000a c5b1 0200 0db7
0556520 000a c5a5 000a c5d1 0055 2d03 0100 2167 0055 2d03 0100 2caf 0000 2677 0100 267f 000a c5f5 0000 000b 0000 267f 0100 32b7
0556600 0000 3287 0200 0db7 000a c60d 0000 315f 0200 0db7 000a c62d 0000 315f 0100 32b7 0000 3287 0200 0ad7 0000 3287 0000 0007
0556660 0200 0db7 000a c5fd 0000 315f 0055 45c3 0100 2caf 0000 30ff 0100 267f 000a c651 0200 0ad7 0000 3287 0000 0007 0200 0db7
0556740 000a c659 0000 315f 0055 45c3 0100 2167 0055 45c3 0000 0003 0000 2dff 0200 0ad7 0000 001f 0000 0007 0200 0db7 0000 2dff
0557020 0000 315f 0000 0003 000a c6b1 000a c6ba 0100 3047 0000 002b 0000 1117 000a c6c2 0000 001f 000a c6ca 000a c6d1 0000 0007
0557100 0100 3047 0000 0083 0100 3047 0000 0033 0100 3047 0000 007b 0300 27bf 000a c6aa 000a c6d9 000a c6e1 000a c6e1 0000 0007
0557160 000a c6d9 000a c6fa 000a c6aa 000a c702 0000 2087 000a c70a 0100 31b7 000a c71c 0100 31b7 0000 3287 0200 0ad7 0000 004f
0557240 0000 0007 0200 0db7 000a c721 0000 315f 003f 2923 0100 31b7 0000 3287 0200 0db7 000a c745 0000 315f 0200 0db7 000a c765
0557320 0000 315f 0100 31b7 0000 3287 0100 3047 0000 00cb 0100 3047 0000 0033 0100 3047 0000 007b 0300 27bf 000a c76d 000a c775
0557400 000a c77d 000a c77d 0000 0007 000a c775 000a c796 000a c76d 000a c79e 0000 2087 000a c7a6 000a c7b4 1000 32cf 000a c7bc
0557460 000a c7c0 000a c7c4 000a c7c8 000a c7cc 000a c7d0 000a c7d4 000a c7d8 000a c7dc 000a c7e0 000a c7e4 000a c7e8 000a c7ec
0557540 000a c7f0 000a c7f4 000a c7f9 0100 1d8f 0000 1fc7 000a c7fd 000a c80e 0000 0a0f 000a c81e 0100 1d8f 0000 37ef 000a c815
0557620 000a c826 0000 0a7f 0000 0007 0000 0a7f 0000 0007 0000 37ef 0000 0007 0000 1fc7 000a c836 0100 1fc7 0000 37ef 0000 0007
0557700 0100 31b7 0000 3287 0200 0db7 000a c851 0000 315f 0200 0db7 000a c871 0000 315f 0100 31b7 0000 3287 0000 1fc7 0400 242f
0557760 0000 1fc7 0000 000b 0000 001f 0000 1e7f 0200 0db7 000a c87d 0000 315f 0200 0db7 000a c8a9 0000 315f 0400 242f 0000 1fc7
0560040 0000 000b 0000 001f 0000 1e7f 0100 1fc7 0000 0daf 0200 2857 000a c8bd 0000 001f 0200 0db7 000a c8c5 0000 315f 0200 0db7
0560120 000a c8e9 0000 315f 0200 2857 000a c8f5 0000 001f 0100 1fc7 0000 0daf 0100 1fc7 000a c905 0200 0daf 0000 3287 0000 37ef
0560200 0100 1fc7 000a c905 000a c921 0000 0007 0100 2247 0000 37ef 000a c928 000a c92c 000a c930 000a c934 000a c938 000a c93c
0560260 0500 26f7 000a c93c 000a c938 000a c934 000a c930 000a c954 0200 0db7 000a c941 000a c969 0000 03a3 000a c96e 0000 030b
0560340 000a c976 0000 034b 000a c97e 0000 0373 000a c986 0000 0103 000a c98e 0000 02b3 000a c996 0000 034b 000a c99e 0000 032b
0560420 000a c9a6 0000 03bb 000a c9ae 0000 0163 000a c9b6 0000 0103 000a c9be 0000 021b 000a c9c6 0000 030b 000a c9ce 0000 0363
0560500 000a c9d6 0000 034b 000a c9de 0000 0333 000a c9e6 0000 037b 000a c9ee 0000 0393 000a c9f6 0000 0373 000a c9fe 0000 034b
0560560 000a ca06 0000 030b 000a ca0e 0000 0103 000a ca16 0000 0103 000a ca1e 0000 0143 000a ca26 0000 01a3 000a ca2e 0000 018b
0560640 000a ca36 0000 01ab 000a ca3e 0000 014b 000a ca46 0000 0103 000a ca4e 0000 01cb 000a ca56 0000 01b3 000a ca5e 0000 01ab
0560720 000a ca66 0000 016b 000a ca6e 0000 01bb 000a ca76 0000 01bb 000a ca7e 0000 0183 000a ca86 0000 0183 000a ca8e ffff fc93
0561000 000a ca96 0000 000b 0000 0007 0000 0003 000a caa6 0000 0003 0000 0007 0200 09cf 0000 0003 0000 000b 000a cab8 0000 0363
0561060 000a cac6 0000 0103 000a cace 0000 0393 000a cad6 0000 034b 000a cade 0000 033b 000a cae6 0000 0343 000a caee 0000 03a3
0561140 000a caf6 0000 039b 000a cafe 0000 0103 000a cb06 0000 0393 000a cb0e 0000 032b 000a cb16 0000 039b 000a cb1e 0000 032b
0561220 000a cb26 0000 0393 000a cb2e 0000 03b3 000a cb36 0000 032b 000a cb3e 0000 0323 000a cb46 0000 0173 000a cb4e ffff fc93
0561300 000a cb56 0000 000b 0000 0007 0000 0003 000a cb66 0000 0003 0000 0007 0200 09cf 0000 0003 0000 000b 000a cb78 000a cba9
0561360 0100 1d77 000a cb89 0200 0daf 0000 3287 000a cb95 0200 2257 0000 2daf 000a cba1 0100 2cb7 0000 2c9f 0100 1d77 000a cbb1
0561440 0200 0daf 0000 3287 000a cbbd 0200 2257 0000 2daf 000a cbc9 0100 20a7 0000 06df 0300 2ad7 0000 0323 0000 2327 0000 0e4f
0561520 0200 0ad7 0000 2c27 0000 0007 0200 0abf 000a cbf9 000a cc45 0200 095f 0047 5de3 000a c6f9 0400 242f 0000 3317 0000 000b
0561600 0000 001f 0000 1e7f 0200 0db7 000a cc05 0000 315f 0200 0db7 000a cc31 0000 315f 0400 242f 0000 3317 0000 000b 0000 001f
```

```
0561660  0000 1e7f 0200 0abf 000a cc51 000a cce5 0200 095f 0045 97e3 000a ccdd 0400 242f 0000 1d77 0000 000b 0000 001f 0000 1e7f
0561740  0200 0db7 000a cc5d 0000 315f 0200 0db7 000a cc89 0000 315f 0400 242f 0000 1d77 0000 000b 0000 001f 0000 1e7f 0100 1d77
0562020  0000 0daf 0200 2857 000a cc9d 0000 001f 0200 0db7 000a cca5 0000 315f 0200 0db7 000a ccc9 0000 315f 0200 2857 000a ccd5
0562100  0000 001f 0100 1d77 0000 0daf 0100 1d77 000a c715 0200 0abf 000a ccf1 000a cd85 0200 095f 0045 97e3 000a cd7d 0400 242f
0562160  0000 1d77 0000 000b 0000 001f 0000 1e7f 0200 0db7 000a ccfd 0000 315f 0200 0db7 000a cd29 0000 315f 0400 242f 0000 1d77
0562240  0000 000b 0000 001f 0000 1e7f 0100 1d77 0000 0daf 0200 2857 000a cd3d 0000 001f 0200 0db7 000a cd45 0000 315f 0200 0db7
0562320  000a cd69 0000 315f 0200 2857 000a cd75 0000 001f 0100 1d77 0000 0daf 0100 1d77 000a c745 0200 0abf 000a cd91 000a ce25
0562400  0200 095f 0045 97e3 000a ce1d 0400 242f 0000 1d77 0000 000b 0000 001f 0000 1e7f 0200 0db7 000a cd9d 0000 315f 0200 0db7
0562460  000a cdc9 0000 315f 0400 242f 0000 1d77 0000 000b 0000 001f 0000 1e7f 0100 1d77 0000 0daf 0200 2857 000a cddd 0000 001f
0562540  0200 0db7 000a cde5 0000 315f 0200 0db7 000a ce09 0000 315f 0200 2857 000a ce15 0000 001f 0100 1d77 0000 0daf 0100 1d77
0562620  000a c779 0200 0abf 000a ce31 000a cec5 0200 095f 0045 97e3 000a cebd 0400 242f 0000 1d77 0000 000b 0000 001f 0000 1e7f
0562700  0200 0db7 000a ce3d 0000 315f 0200 0db7 000a ce69 0000 315f 0400 242f 0000 1d77 0000 000b 0000 001f 0000 1e7f 0100 1d77
0562760  0000 0daf 0200 2857 000a ce7d 0000 001f 0200 0db7 000a ce85 0000 315f 0200 0db7 000a cea9 0000 315f 0200 2857 000a ceb5
0563040  0000 001f 0100 1d77 0000 0daf 0100 1d77 000a c7ad 0200 0abf 000a ced1 000a cf65 0200 095f 0045 97e3 000a cf5d 0400 242f
0563120  0000 1d77 0000 000b 0000 001f 0000 1e7f 0200 0db7 000a cedd 0000 315f 0200 0db7 000a cf09 0000 315f 0400 242f 0000 1d77
0563200  0000 000b 0000 001f 0000 1e7f 0100 1d77 0000 0daf 0200 2857 000a cf1d 0000 001f 0200 0db7 000a cf25 0000 315f 0200 0db7
0563260  000a cf49 0000 315f 0200 2857 000a cf55 0000 001f 0100 1d77 0000 0daf 0100 1d77 000a c7e1 0200 0abf 000a cf71 000a d005
0563340  0200 095f 0045 97e3 000a cffd 0400 242f 0000 1d77 0000 000b 0000 001f 0000 1e7f 0200 0db7 000a cf7d 0000 315f 0200 0db7
0563420  000a cfa9 0000 315f 0400 242f 0000 1d77 0000 000b 0000 001f 0000 1e7f 0100 1d77 0000 0daf 0200 2857 000a cfbd 0000 001f
0563500  0200 0db7 000a cfc5 0000 315f 0200 0db7 000a cfe9 0000 315f 0200 2857 000a cff5 0000 001f 0100 1d77 0000 0daf 0100 1d77
0563560  000a c815 0000 002c 000a f248 b27c b66c 0000 001e 7fff ffff 000a d039 0200 0db5 0200 2f35 0000 37ff 0000 022b 0000 315f
0563640  0000 002c 000a d038 b4f0 b4e4 0000 001d 7fff ffff 0008 e35d 0000 01fc 0000 0049 000a 2a28 0002 438a 0018 1c20 0000 37ff
0563720  b328 0daf 000a d010 0000 0000 0032 2f68 6f6d 652f 6f73 6173 312f 612f 7669 6a61 792f 5648 444c 2f70 6172 7365 722f 7072
0564000  6f6c 6f67 2f6e 6577 6e65 772f 7633 2e31 000a c849 0000 002c 000a f29c b27c b66c 0000 13e8 7fff ffff 000a 2a54 0200 0db5
0564060  0200 224d 0000 37ff 0000 3287 0000 315f 000a d13c 0000 0044 001a 4850 7fff ffff 0000 0000 000a d13c 0000 002c b4f0 b4e4
0564140  0000 001e 7fff ffff 0008 ca1d 0000 0000 0000 0000 000a d0ac 0002 438a 000a d110 000a ecf0 0000 37ff b328 2b07 000a d0b0
0564220  0000 0000 0010 7072 6f77 696e 646f 7773 5f75 7469 6c73 00b9 000b 00ec 0000 0058 b130 b66c 0000 0020 0000 13e7 000a d16d
0564300  0200 04b5 0200 270d 0000 37ff 0000 3297 0000 315f 000a d193 0000 002c b4f0 b4e4 0000 001f 7fff ffff 0008 ca7d 0000 0000
0564360  0000 0000 000a d140 0002 438a 001a 43a8 000b 1ba8 0000 0000 0000 0010 000a d144 0000 0000 0043 2f68 6f6d 652f 6f73 6173
0564440  312f 612f 7669 6a61 792f 5648 444c 2f70 6172 7365 722f 7072 6f6c 6f67 2f6e 6577 6e65 772f 7633 2e31 2f70 726f 7769 6e64
0564520  6f77 735f 7574 696c 7300 1e7f 0046 2f68 6f6d 652f 6f73 6173 312f 612f 7669 6a61 792f 5648 444c 2f70 6172 7365 722f 7072
0564600  6f6c 6f67 2f6e 6577 6e65 772f 7633 2e31 2f70 726f 7769 6e64 6f77 735f 7574 696c 732e 706c 0000 315f 0000 002c 000b 8d14
0564660  b27c b66c 0000 00cd 7fff ffff 000b 22a4 0200 0db5 0200 2f35 0000 3b17 0000 025b 0000 315f 003a 2f68 6f6d 652f 6f73 6173
0564740  312f 612f 7669 6a61 792f 5648 444c 2f70 6172 7365 722f 7072 6f6c 6f67 2f6e 6577 6e65 772f 7633 2e31 2f70 726f 7461 6c6b
0565020  006c 6962 003d 2f68 6f6d 652f 6f73 6173 312f 612f 7669 6a61 792f 5648 444c 2f70 6172 7365 722f 7072 6f6c 6f67 2f6e 6577
0565100  6e65 772f 7633 2e31 2f70 726f 7461 6c6b 2e70 6c00 0040 2f68 6f6d 652f 6f73 6173 312f 612f 7669 6a61 792f 5648 444c 2f70
0565160  6172 7365 722f 7072 6f6c 6f67 2f6e 6577 6e65 772f 7633 2e31 2f70 726f 7461 6c6b 5f75 7469 6c73 000a 0043 2f68 6f6d 652f
0565240  6f73 6173 312f 612f 7669 6a61 792f 5648 444c 2f70 6172 7365 722f 7072 6f6c 6f67 2f6e 6577 6e65 772f 7633 2e31 2f70 726f
0565320  7461 6c6b 5f75 7469 6c73 2e70 6c00 2020 0000 002c 000a e760 b27c b66c 0000 003f 7fff ffff 000a f248 0200 0db5 0200 2f35
0565400  0000 38df 0000 023b 0000 315f 0000 002c 000a f410 b27c b66c 0000 01a3 7fff ffff 000b 2000 0200 0db5 0200 224d 0000 38df
0565460  0000 38c7 0000 315f 2c78 0012 0002 438a 4e1c 0000 0000 3f4f 228c 0000 0000 002c 000e 6fc8 b27c b66c 0000 04b0 7fff ffff
0565540  000e 8704 0200 0db5 0200 22ed 0000 4b37 0073 8003 0000 315f 0000 002c 0007 fec0 b27c b66c 0000 0043 7fff ffff 000a e858
0565620  0200 0db5 0200 294d 0000 38c7 0000 38df 0000 315f 0000 0034 000c 2304 b27c b66c 0000 0293 7fff ffff 000a fe50 0200 0db5
0565700  0400 242d 0000 3fb7 0000 0013 0000 3e1f 0000 21cf 0000 315f b464 0bcc 000a fe54 0000 0000 0000 0034 0008 0314 b27c b66c
0565760  0000 0044 7fff ffff 000a d4b0 0200 0db5 0400 242d 0000 38f7 0000 001b 0000 38c7 0000 21cf 0000 315f 0000 0034 000a d47c
0566040  b27c b66c 0000 0045 7fff ffff 000a d4e4 0200 0db5 0400 242d 0000 38ff 0000 0013 0000 38c7 0000 21cf 0000 315f 0000 0034
0566120  000a d4b0 b27c b66c 0000 0046 7fff ffff 000a d518 0200 0db5 0400 242d 0000 3907 0000 0013 0000 38c7 0000 21cf 0000 315f
0566200  0000 0034 000a d4e4 b27c b66c 0000 0047 7fff ffff 000a d574 0200 0db5 0400 242d 0000 390f 0000 0023 0000 38c7 0000 21cf
0566260  0000 315f 0011 ba74 000a 3380 ffff ffff 0200 1f97 0000 38c7 0000 0008 000c 0a98 000c 0a98 0001 0047 0000 0000 0000 0034
0566340  000a d518 b27c b66c 0000 0048 7fff ffff 000a d5d8 0200 0db5 0400 242d 0000 1f87 0000 0013 0000 38c7 0000 21cf 0000 315f
0566420  0000 1f87 b328 1ca0 000a d578 0000 0000 0008 ceac 0200 3917 0000 38c7 0000 0008 000c 0b60 000c 0b60 0001 0047 0000 0000
0566500  0000 0034 000a d574 b27c b66c 0000 0049 7fff ffff 000a d644 0200 0db5 0400 242d 0000 3917 0000 0013 0000 38c7 0000 21cf
0566560  0000 315f 0000 3917 b464 1c3c 000a d5dc 000a d670 0011 b5d4 0000 0000 000a d5b0 0300 3917 0000 38c7 0000 000c 000c 0b90
0566640  000c 0b90 0001 0047 0000 0000 0000 0034 000a d5d8 b27c b66c 0000 004a 7fff ffff 000a d6a4 0200 0db5 0400 242d 0000 3917
0566720  0000 001b 0000 38c7 0000 21cf 0000 315f b464 d23c 000a d648 0000 0000 0008 cecc 0200 391f 0000 38c7 0000 0008 000b 5afc
```

```
0567000 000b 5afc 0001 0047 0000 0000 0000 0034 000a d644 b27c b66c 0000 004b 7fff ffff 000a 4718 0200 0db5 0400 242d 0000 391f
0567060 0000 0013 0003 38c7 0000 21cf 0000 315f 0000 391f b328 1b70 000a d6a8 0000 0000 000a 3f88 0000 0000 0011 b7f0 0000 0000
0567140 0008 ceec 0100 3927 0000 38c7 0000 0004 000b 532c 000b 532c 0001 0047 0000 0000 0000 0034 000a d634 b27c b66c 0000 004c
0567220 7fff ffff 000a d78c 0200 0db5 0400 242d 0000 3927 0000 000b 0000 38c7 0000 21cf 0000 315f 0000 3927 b328 1afc 000a d71c
0567300 0000 0000 000a 3f98 0000 0000 000a 4548 0000 0000 ffff ffff 0300 392f 0000 38c7 0000 000c 000b 594c 000b 594c 0001 0047
0567360 0000 0000 0000 0034 000a d718 b27c b66c 0000 004d 7fff ffff 000a d7f0 0200 0db5 0400 242d 0000 392f 0000 001b 0000 38c7
0567440 0000 21cf 0000 315f 0000 392f b328 1a88 000a d790 0000 0000 0008 bd2c 0200 20f7 0000 38c7 0000 0008 000b 655c 000c 1588
0567520 0001 0047 0000 0000 000c 0034 000a d78c b27c b66c 0000 004e 7fff ffff 000a d850 0200 0db5 0400 242d 0000 20f7 0000 0013
0567600 0000 38c7 0000 21cf 0000 315f b464 d23c 000a d7f4 0000 0000 0008 cf0c 0300 3937 0000 38c7 0000 000c 000b 56c4 000b 56c4
0567660 0001 0047 0000 0000 0000 0034 000a d7f0 b27c b66c 0000 004f 7fff ffff 000a d8b4 0200 0db5 0400 242d 0000 3937 0000 001b
0567740 0000 38c7 0000 21cf 0000 315f 0000 3937 b328 19c4 000a d854 0000 0000 0008 abec 0300 393f 0000 38c7 0000 000c 000b 50e8
0570020 000b 50e8 0001 0047 0000 0000 0000 0034 000a d850 b27c b66c 0000 0050 7fff ffff 000a d918 0200 0db5 0400 242d 0000 393f
0570100 0000 001b 0000 38c7 0000 21cf 0000 315f 0000 393f b328 1960 000a d8b8 0000 0000 ffff ffff 0200 2397 0000 38c7 0000 0008
0570160 000c 0bd4 000c 0d38 0001 0047 0000 0000 0000 0034 000a d8b4 b27c b66c 0000 0051 7fff ffff 000a d97c 0200 0db5 0400 242d
0570240 0000 2397 0000 0013 0000 38c7 0000 21cf 0000 315f 0000 2397 b464 18fc 000a d91c 000a d9a8 000a d8f0 0300 2397 0000 38c7
0570320 0000 000c 000c 0afc 000c 0b40 0001 0047 0000 0000 0000 0034 000a d918 b27c b66c 0000 0052 7fff ffff 000a d9dc 0200 0db5
0570400 0400 242d 0000 2397 0000 001b 0000 38c7 0000 21cf 0000 315f b464 d23c 000a d980 0000 0000 0008 cf2c 0200 3947 0000 38c7
0570460 0000 0008 000b 564c 000b 564c 0001 0047 0000 0000 0000 0034 000a d97c b27c b66c 0000 0053 7fff ffff 000a da40 0200 0db5
0570540 0400 242d 0000 3947 0000 0013 0000 38c7 0000 21cf 0000 315f 0000 3947 b328 1838 000a d9e0 0000 0000 000a a454 0200 394f
0570620 0000 38c7 0000 0008 000b 5598 000b 5598 0001 0047 0000 0000 0000 0034 000a d9dc b27c b66c 0000 0054 7fff ffff 000a dab4
0570700 0200 0db5 0400 242d 0000 394f 0000 0013 0000 38c7 0000 21cf 0000 315f 0000 394f b328 17d4 000a da44 0000 0000 0011 b9f4
0570760 000a 3314 0011 5710 000b 3ee4 0008 ecac 0300 23a7 0000 38c7 0000 000c 000b 4b80 000b 4b80 0001 0047 0000 0000 0000 0034
0571040 000a da40 b27c b66c 0000 0055 7fff ffff 000a db14 0200 0db5 0400 242d 0000 23a7 0000 001b 0000 38c7 0000 21cf 0000 315f
0571120 b464 d23c 000a dab8 0000 0000 0008 cfec 0200 3957 0000 38c7 0000 0008 000b 60e0 000b 60e0 0001 0047 0000 0000 0000 0034
0571200 000a dab4 b27c b66c 0000 0056 7fff ffff 000a db88 0200 0db5 0400 242d 0000 3957 0000 0013 0000 38c7 0000 21cf 0000 315f
0571260 0000 3957 b328 1700 000a db18 0000 0000 0011 bc70 0000 0000 0005 6765 7464 6200 0008 d02c 0100 395f 0000 38c7 0000 0004
0571340 000c 0924 000c 0924 0001 0047 0000 0000 0000 0034 000a db14 b27c b66c 0000 0057 7fff ffff 000a dbfc 0200 0db5 0400 242d
0571420 0000 395f 0000 000b 0000 38c7 0000 21cf 0000 315f 0000 395f b328 168c 000a db8c 0000 0000 0011 bbec 0000 0000 0011 b7d0
0571500 000d a714 0008 d04c 0000 3967 0000 38c7 0000 0000 000b 5e4c 000b 5e4c 0001 0047 0000 0000 0000 0034 000a db88 b27c b66c
0571560 0000 0058 7fff ffff 000a dc60 0200 0db5 0400 242d 0000 3967 0000 0003 0000 38c7 0000 21cf 0000 315f 0000 3967 b328 1618
0571640 000a dc00 0000 0000 0008 40cc 0300 396f 0000 38c7 0000 000c 000c 0f1c 000c 0f1c 0001 0047 0000 0000 0000 0034 000a dbfc
0571720 b27c b66c 0000 0059 7fff ffff 000a dcd4 0200 0db5 0400 242d 0000 396f 0000 001b 0000 38c7 0000 21cf 0000 315f 0000 396f
0572000 b328 15b4 000a dc64 0000 0000 0005 7075 7464 6200 0011 bcd0 0000 0000 000a da18 0200 294f 0000 38c7 0000 0008 000b 4784
0572060 000b 2024 0001 0047 0000 0000 0000 0034 000a dc60 b27c b66c 0000 005a 7fff ffff 000a dd34 0200 0db5 0400 242d 0000 294f
0572140 0000 0013 0000 38c7 0000 21cf 0000 315f b464 d23c 000a dcd8 000a dd60 000a dcac 0300 294f 0000 38c7 0000 000c 000c 0508
0572220 000c 0508 0001 0047 0000 0000 0000 0034 000a dcd4 b27c b66c 0000 005b 7fff ffff 000a dd94 0200 0db5 0400 242d 0000 294f
0572300 0000 001b 0000 38c7 0000 21cf 0000 315f b464 d23c 000a dd38 0000 0000 0008 d10c 0200 3977 0000 38c7 0000 0008 000b 5f88
0572360 000b 5f88 0001 0047 0000 0000 0000 0034 000a d134 b27c b66c 0000 005c 7fff ffff 000a de08 0200 0db5 0400 242d 0000 3977
0572440 0000 0013 0000 38c7 0000 21cf 0000 315f 0000 3977 b328 1480 000a dd98 0000 0000 0011 b734 000e 4470 0004 6572 7231 0000
0572520 ffff ffff 0200 397f 0000 38c7 0000 0008 000c 0d94 000c 0d94 0001 0047 0000 0000 0000 0034 000a dd94 b27c b66c 0000 005d
0572600 7fff ffff 000a de6c 0200 0db5 0400 242d 0000 397f 0000 0013 0000 38c7 0000 21cf 0000 315f 0000 397f b328 140c 000a de0c
0572660 0000 0000 0008 d14c 0200 3987 0000 38c7 0000 0008 000c 0528 000c 0528 0001 0047 0000 0000 0000 0034 000a de08 b27c b66c
0572740 0000 005e 7fff ffff 000a dee0 0200 0db5 0400 242d 0000 3987 0000 0013 0000 38c7 0000 21cf 0000 315f 0000 3987 b464 13a8
0573020 000a de70 000a df0c 0005 7374 6163 6b00 0003 636f 6e00 0000 000a de44 0300 3987 0000 38c7 0000 000c 000c 05ac 000c 05f0
0573100 0001 0047 0000 0000 0000 0034 000a de6c b27c b66c 0000 005f 7fff ffff 000a df40 0200 0db5 0400 242d 0000 3987 0000 001b
0573160 0000 38c7 0000 21cf 0000 315f b464 d23c 000a dee4 0000 0000 ffff ffff 0300 398f 0000 38c7 0000 000c 000b 5ff0 000b 5ff0
0573240 0001 0047 0000 0000 0000 0034 000a dee0 b27c b66c 0000 0060 7fff ffff 000a dfa4 0200 0db5 0400 242d 0000 398f 0000 001b
0573320 0000 38c7 0000 21cf 0000 315f 0000 399f b328 12d4 000a df44 0000 0000 0008 d36c 0100 2a77 0000 38c7 0000 0004 000c 0624
0573400 000c 0634 0001 0047 0000 0000 0000 0034 000a df40 b27c b66c 0000 0061 7fff ffff 000a e004 0200 0db5 0400 242d 0000 2a77
0573460 0000 000b 0000 38c7 0000 21cf 0000 315f b464 d23c 000a dfa8 0000 0000 0008 cd6c 0000 38c7 0000 38c7 0000 000c 000c 04ec
0573540 000c 04ec 0001 0047 0000 0000 0000 0034 000a dfa4 b27c b66c 0000 0062 7fff ffff 000a e070 0200 04b5 0400 242d 0000 38c7
0573620 0000 0003 0000 38c7 0000 21cf 0000 315f 0000 38c7 b328 1210 000a e008 0000 0000 0011 b910 000e 4304 ffff ffff 0300 3997
0573700 0000 38c7 0000 000c 000b 58d4 000b 58d4 0001 0047 0000 0000 0000 0034 000a e004 b27c b66c 0000 0063 7fff ffff 000a e0d4
0573760 0200 0db5 0400 242d 0000 3997 0000 001b 0000 38c7 0000 21cf 0000 315f 0000 3997 b328 11a4 000a e074 0000 0000 ffff ffff
0574040 0100 399f 0000 38c7 0000 0004 000c 0840 000b 4e58 0001 0047 0000 0000 0000 0034 000a e070 b27c b66c 0000 0064 7fff ffff
```

| | | | | | | | | | | | | | | | | | | | | | | | | |
|---|---|---|---|---|---|---|---|---|---|---|---|---|---|---|---|---|---|---|---|---|---|---|---|---|
| 0574120 | 000a | e138 | 0200 | 0db5 | 0400 | 242d | 0000 | 399f | 0000 | 000b | 0000 | 38c7 | 0000 | 21cf | 0000 | 315f | 0000 | 399f | b464 | 1140 | 000a | e0d8 | 000a | e164 |
| 0574200 | 000a | e0ac | 0200 | 399f | 0000 | 38c7 | 0000 | 0008 | 000b | 4edc | 000b | 4edc | 0001 | 0047 | 0000 | 0000 | 0000 | 0034 | 000a | e0d4 | b27c | b66c | 0000 | 0065 |
| 0574260 | 7fff | ffff | 000a | e198 | 0200 | 0db5 | 0400 | 242d | 0000 | 399f | 0000 | 0013 | 0000 | 38c7 | 0000 | 21cf | 0000 | 315f | b464 | d23c | 000a | e13c | 0000 | 0000 |
| 0574340 | ffff | ffff | 0100 | 39a7 | 0000 | 38c7 | 0000 | 0004 | 000b | 4d84 | 000b | 4d84 | 0001 | 0047 | 0000 | 0000 | 0000 | 0034 | 000a | e138 | b27c | b66c | 0000 | 0066 |
| 0574420 | 7fff | ffff | 000a | e1fc | 0200 | 0db5 | 0400 | 242d | 0000 | 39a7 | 0000 | 000b | 0000 | 38c7 | 0000 | 21cf | 0000 | 315f | 0000 | 39a7 | b328 | 107c | 000a | e19c |
| 0574500 | 0000 | 0000 | ffff | ffff | 0100 | 39af | 0000 | 38c7 | 0000 | 0004 | 000c | 07f8 | 000c | 07f8 | 0001 | 0047 | 0000 | 0000 | 0000 | 0034 | 000a | e198 | b27c | b66c |
| 0574560 | 0000 | 0067 | 7fff | ffff | 000a | e260 | 0200 | 0db5 | 0400 | 242d | 0000 | 39af | 0000 | 000b | 0000 | 38c7 | 0000 | 21cf | 0000 | 315f | 0000 | 39af | b328 | 1018 |
| 0574640 | 000a | e200 | 0000 | 0000 | ffff | ffff | 0100 | 39b7 | 0000 | 38c7 | 0000 | 0004 | 000b | e044 | 000b | e044 | 0001 | 0047 | 0000 | 0000 | 0000 | 0034 | 000a | e1fc |
| 0574720 | b27c | b66c | 0000 | 0068 | 7fff | ffff | 000a | e2c4 | 0200 | 0db5 | 0400 | 242d | 0000 | 39b7 | 0000 | 000b | 0000 | 38c7 | 0000 | 21cf | 0000 | 315f | 0000 | 39b7 |
| 0575000 | b328 | 0fb4 | 000a | e264 | 0000 | 0000 | 0008 | dd8c | 0200 | 2e1f | 0000 | 38c7 | 0000 | 0008 | 000b | 49e4 | 000b | 49e4 | 0001 | 0047 | 0000 | 0000 | 0000 | 0034 |
| 0575060 | 000a | e260 | b27c | b66c | 0000 | 0069 | 7fff | ffff | 000a | e324 | 0200 | 0db5 | 0400 | 242d | 0000 | 2e1f | 0000 | 0013 | 0000 | 38c7 | 0000 | 21cf | 0000 | 315f |
| 0575140 | b464 | d23c | 000a | e2c8 | 000a | e350 | 000a | e29c | 0300 | 2e1f | 0000 | 38c7 | 0000 | 000c | 000b | 4ab0 | 000b | 4ab0 | 0001 | 0047 | 0000 | 0000 | 0000 | 0034 |
| 0575220 | 000a | e2c4 | b27c | b66c | 0000 | 006a | 7fff | ffff | 000a | e384 | 0200 | 0db5 | 0400 | 242d | 0000 | 2e1f | 0000 | 001b | 0000 | 38c7 | 0000 | 21cf | 0000 | 315f |
| 0575300 | b464 | d23c | 000a | e328 | 0000 | 0000 | 0008 | d16c | 0300 | 39bf | 0000 | 38c7 | 0000 | 000c | 000c | 0ee0 | 000b | 5c5c | 0001 | 0047 | 0000 | 0000 | 0000 | 0034 |
| 0575360 | 000a | e324 | b27c | b66c | 0000 | 006b | 7fff | ffff | 000a | e3f8 | 0200 | 0db5 | 0400 | 242d | 0000 | 39bf | 0000 | 001b | 0000 | 38c7 | 0000 | 21cf | 0000 | 315f |
| 0575440 | 0000 | 39bf | b328 | 0e90 | 000a | e388 | 0000 | 0000 | 000a | 3fd8 | 0000 | 0000 | 0011 | b6d4 | 000a | 387c | ffff | ffff | 0300 | 2f9f | 0000 | 38c7 | 0000 | 000c |
| 0575520 | 000b | 5730 | 000b | 5730 | 0001 | 0047 | 0000 | 0000 | 0000 | 0034 | 000a | e384 | b27c | b66c | 0000 | 006c | 7fff | ffff | 000a | e884 | 0200 | 0db5 | 0400 | 242d |
| 0575600 | 0000 | 2f9f | 0000 | 001b | 0000 | 38c7 | 0000 | 21cf | 0000 | 315f | 0000 | 2f9f | b328 | 0e1c | 000a | e3fc | 0000 | 0000 | 0000 | 0034 | 0008 | 0410 | b27c | b66c |
| 0575660 | 0000 | 006d | 7fff | ffff | 000a | e488 | 0200 | 0db5 | 0200 | 2855 | 0200 | 3975 | 0000 | 0e3f | 0000 | 0daf | 0000 | 38c7 | 0000 | 315f | 0200 | 3977 | b328 | 0dd8 |
| 0575740 | 000a | e440 | 0000 | 0000 | 000a | e468 | 000a | 2074 | 0000 | 0038 | 000a | e43c | b27c | b66c | 0000 | 006e | 7fff | ffff | 000a | eb98 | 0200 | 0db5 | 0200 | 2855 |
| 0576020 | 0300 | 398d | 0000 | 0e3f | 0000 | 0ab7 | 0000 | 0daf | 0000 | 38c7 | 0000 | 315f | 0300 | 398f | b328 | 0d88 | 000a | e48c | 0000 | 0000 | 000d | d15c | 000a | 2134 |
| 0576100 | 0008 | 7375 | 625f | 7465 | 726d | 0000 | 2c78 | 0012 | 0002 | 438a | 4e1c | 0000 | 0000 | 3a37 | 228c | 0000 | 0000 | 0030 | 0007 | 9cd0 | b27c | b66c | 0000 | 0070 |
| 0576160 | 7fff | ffff | 000b | 9170 | 0200 | 0db5 | 0300 | 32bd | 0000 | 0e4f | 0000 | 0323 | 0000 | 2327 | 0000 | 315f | 0008 | 6861 | 735f | 7661 | 7273 | 0000 | 0006 | 6f63 |
| 0576240 | 6375 | 7273 | 0000 | 0000 | 0009 | 7465 | 726d | 5f61 | 746f | 6d00 | 002a | 2f68 | 6f6d | 652f | 6f73 | 6173 | 322f | 622f | 7175 | 696e | 7475 | 732f | 7077 | 312e |
| 0576320 | 312f | 6c69 | 6272 | 6172 | 792f | 6f63 | 6375 | 7273 | 0000 | 0013 | 000a | e4e8 | 002d | 2f68 | 6f6d | 652f | 6f73 | 6173 | 322f | 622f | 7175 | 696e | 7475 | 732f |
| 0576400 | 7077 | 312e | 312f | 6c69 | 6272 | 6172 | 792f | 6f63 | 6375 | 7273 | 2e70 | 6c00 | 000b | 42a0 | 0000 | 002c | 000b | 3028 | b27c | b66c | 0000 | 04b5 | 7fff | ffff |
| 0576460 | 000d | d97c | 0200 | 0db5 | 0200 | 224d | 0000 | 4b07 | 0000 | 4ae7 | 0000 | 315f | 0004 | 7371 | 7274 | 005f | 0000 | 002c | 000d | d9bc | b27c | b66c | 0000 | 04b6 |
| 0576540 | 7fff | ffff | 000b | 305c | 0200 | 0db5 | 0200 | 24bd | 0000 | 3287 | 0000 | 4ae7 | 0000 | 315f | b464 | d82c | 000a | e5ec | 000b | 2774 | 0000 | 002c | 000c | 21a0 |
| 0576620 | b27c | b66c | 0000 | 0292 | 7fff | ffff | 000b | 026c | 0200 | 0db5 | 0200 | 284d | 0000 | 3e1f | 0000 | 3e7f | 0000 | 315f | 0029 | 2f68 | 6f6d | 652f | 6f73 | 6173 |
| 0576700 | 322f | 622f | 7175 | 696e | 7475 | 732f | 7077 | 312e | 312f | 6c69 | 6272 | 6172 | 792f | 6572 | 726e | 6f00 | 0000 | 002c | 000b | 2394 | b27c | b66c | 0000 | 00d1 |
| 0576760 | 7fff | ffff | 000b | 8e04 | 0200 | 0db5 | 0200 | 284d | 0000 | 3a97 | 0000 | 3b17 | 0000 | 315f | 0000 | 0034 | 000b | 245c | b27c | b66c | 0000 | 00d2 | 7fff | ffff |
| 0577040 | 000a | e9f0 | 0200 | 0db5 | 0400 | 242d | 0000 | 3a9f | 0000 | 0013 | 0000 | 3a97 | 0000 | 21cf | 0000 | 315f | 2c78 | 0012 | 0002 | 438a | 4e1c | 0000 | 0000 | 3b3f |
| 0577120 | 228c | 315f | 0035 | 2f68 | 6f6d | 652f | 6f73 | 6173 | 322f | 622f | 7175 | 696e | 7475 | 732f | 6765 | 6e65 | 7269 | 632f | 7170 | 6c69 | 6232 | 2e35 | 2f6c | 6962 |
| 0577200 | 7261 | 7279 | 2f6f | 6363 | 7572 | 7300 | 0038 | 2f68 | 6f6d | 652f | 6f73 | 6173 | 322f | 622f | 7175 | 696e | 7475 | 732f | 6765 | 6e65 | 7269 | 632f | 7170 | 6c69 |
| 0577260 | 6232 | 2e35 | 2f6c | 6962 | 7261 | 7279 | 2f6f | 6363 | 7572 | 712e | 706c | 0000 | 0000 | 002c | 000b | 1fa8 | b27c | b66c | 0000 | 0075 | 7fff | ffff | 000a | d378 |
| 0577340 | 0200 | 0db5 | 0200 | 2f35 | 0000 | 39ef | 0000 | 0243 | 0000 | 315f | 000b | 4c94 | 0300 | 6557 | 0000 | 3287 | 0000 | 000c | 000b | 4d14 | 000b | 1c68 | 0001 | 0069 |
| 0577420 | 0000 | 0000 | 28c4 | 000c | 0013 | 3438 | 4950 | 228c | 002e | 2f68 | 6f6d | 652f | 6f73 | 6173 | 322f | 622f | 7175 | 696e | 7475 | 732f | 6765 | 6e65 | 7269 | 632f |
| 0577500 | 7170 | 6c69 | 6232 | 2e35 | 2f6c | 6962 | 7261 | 7279 | 0000 | 0000 | 0000 | 002c | 000b | 2328 | b27c | b66c | 0000 | 0093 | 7fff | ffff | 000a | f29c | 0200 | 0db5 |
| 0577560 | 0200 | 224d | 0000 | 39ef | 0000 | 39c7 | 0000 | 315f | 000f | 6368 | 6172 | 735f | 746f | 5f73 | 7472 | 6561 | 6d00 | 0000 | 0000 | 002c | 000a | aaa0 | b27c | b66c |
| 0577640 | 0000 | 0094 | 7fff | ffff | 000b | 2040 | 0200 | 0db5 | 0200 | 24b4 | 0000 | 38c7 | 0000 | 39c7 | 0000 | 315f | 0000 | 002c | 000a | d410 | b27c | b66c | 0000 | 0079 |
| 0577720 | 7fff | ffff | 000b | 20bc | 0200 | 0db5 | 0200 | 284d | 0000 | 39c7 | 0000 | 39ef | 0000 | 315f | 0000 | 0034 | 000a | e3f8 | b27c | b66c | 0000 | 007a | 7fff | ffff |
| 0600000 | 000a | e8b8 | 0200 | 0db5 | 0400 | 242d | 0000 | 39f7 | 0000 | 0013 | 0000 | 39c7 | 0000 | 21cf | 0000 | 315f | 0000 | 0034 | 000a | e884 | b27c | b66c | 0000 | 007b |
| 0600060 | 7fff | ffff | 000a | e3ec | 0200 | 0db5 | 0400 | 242d | 0000 | 39ff | 0000 | 0013 | 0000 | 39c7 | 0000 | 21cf | 0000 | 315f | 0000 | 0034 | 000a | e8b8 | b27c | b66c |
| 0600140 | 0000 | 007c | 7fff | ffff | 000a | e920 | 0200 | 0db5 | 0400 | 242d | 0000 | 3a07 | 0000 | 0013 | 0000 | 39c7 | 0000 | 21cf | 0000 | 315f | 0000 | 0034 | 000a | e8ec |
| 0600220 | b27c | b66c | 0000 | 007d | 7fff | ffff | 000a | e954 | 0200 | 0db5 | 0400 | 242d | 0000 | 3a0f | 0000 | 0013 | 0000 | 39c7 | 0000 | 21cf | 0000 | 315f | 0000 | 0034 |
| 0600300 | 000a | e920 | b27c | b66c | 0000 | 007e | 7fff | ffff | 000a | e988 | 0200 | 0db5 | 0400 | 242d | 0000 | 3a17 | 0000 | 001b | 0000 | 39c7 | 0000 | 21cf | 0000 | 315f |
| 0600360 | 0000 | 0034 | 000a | e954 | b27c | b66c | 0000 | 007f | 7fff | ffff | 000a | e9bc | 0200 | 0db5 | 0400 | 242d | 0000 | 3a1f | 0000 | 001b | 0000 | 39c7 | 0000 | 21cf |
| 0600440 | 0000 | 315f | 0000 | 0034 | 000a | e988 | b27c | b66c | 0000 | 0080 | 7fff | ffff | 000b | 2098 | 0200 | 0db5 | 0400 | 242d | 0000 | 3a27 | 0000 | 0013 | 0000 | 39c7 |
| 0600520 | 0000 | 21cf | 0000 | 315f | 0000 | 0034 | 000a | e6a4 | b27c | b66c | 0000 | 00d3 | 7fff | ffff | 000a | ea24 | 0200 | 0db5 | 0400 | 242d | 0000 | 3b1f | 0000 | 0013 |
| 0600600 | 0000 | 3a97 | 0000 | 21cf | 0000 | 315f | 0000 | 0034 | 000a | e9f0 | b27c | b66c | 0000 | 00d4 | 7fff | ffff | 000a | ea58 | 0200 | 0db5 | 0400 | 242d | 0000 | 3b27 |
| 0600660 | 0000 | 0013 | 0000 | 3a97 | 0000 | 21cf | 0000 | 315f | 0000 | 0034 | 000a | ea24 | b27c | b66c | 0000 | 00d5 | 7fff | ffff | 000a | ea8c | 0200 | 0db5 | 0400 | 242d |
| 0600740 | 0000 | 3b2f | 0000 | 0013 | 0000 | 3a97 | 0000 | 21cf | 0000 | 315f | 0000 | 0034 | 000a | ea58 | b27c | b66c | 0000 | 00d6 | 7fff | ffff | 000a | eac0 | 0200 | 0db5 |
| 0601020 | 0400 | 242d | 0000 | 3b2f | 0000 | 001b | 0000 | 3a97 | 0000 | 21cf | 0000 | 315f | 0000 | 0034 | 000a | ea8c | b27c | b66c | 0000 | 00d7 | 7fff | ffff | 000a | eb30 |
| 0601100 | 0200 | 0db5 | 0400 | 242d | 0000 | 3b37 | 0000 | 001b | 0000 | 3a97 | 0000 | 21cf | 0000 | 315f | 000a | 22d8 | 0000 | 0000 | 2954 | 0034 | 0002 | 438a | 45d0 | 46d8 |
| 0601160 | 4754 | 33f4 | 37dc | 379c | 6e74 | 3d48 | 3ba0 | 0000 | 000b | 4024 | 0018 | aa50 | aaf0 | ffff | ac08 | 3858 | 37dc | 234c | 000b | 4278 | 0000 | 0034 | 000a | eac0 |

```
0601240  b27c b66c 0000 00d8 7fff ffff 000b 8e30 0200 0db5 0400 2424 0000 3b37 0000 0013 0000 3a97 0000 21cf 0000 315f 000c 02dc
0601320  2c78 002e 0002 438a 370c 0018 2520 4740 344c 41fc 0000 0003 35c8 35b0 0018 247c 000b 42f4 0014 3d00 4a7c 000c 723c eb92
0601400  0000 0034 0001 e488 b27c b66c 0000 00d9 7fff ffff 000a ec00 0200 0db5 0200 2855 0200 3b24 0000 0003 0000 0ab7 0000 3a97
0601460  0000 315f 000a e6dc 2954 0030 0002 438a 45c4 4700 477c 47f8 001c 33a0 320c 3788 6f34 3984 0018 001c 38e8 386c 37f0 3cf4
0601540  242c 0000 000b 4338 0000 0038 000a eb98 b27c b66c 0000 00da 7fff ffff 000a ec88 0200 0db5 0200 2855 0300 3b24 0000 0003
0601620  0000 0ad7 0000 0ab7 0000 3a97 0000 315f 2954 0050 0002 438a 45e8 001c 46d8 4754 47f8 0024 4864 0018 3410 0020 37dc 37c4
0601700  001c 6e74 3468 3894 0024 37f0 40b4 0020 000b 42f4 0020 aa88 001c aaf0 ffff ac08 3968 0018 3d9c 3858 37dc 234c 000b 4338
0601760  0000 0034 000a ec00 b27c b66c 0000 00db 7fff ffff 000a ecbc 0200 0db5 0200 2855 0200 3b35 0000 0003 0000 0e3f 0000 3a97
0602040  0000 315f 0000 0038 000a ec88 b27c b66c 0000 00dc 7fff ffff 000b 8fd0 0200 0db5 0200 2855 0300 3b35 0000 0003 0000 0ad7
0602120  0000 0e3f 0000 3a97 0000 315f 000b 4cb8 28c4 002c 000b 4424 45d0 46ec 33a0 320c 3788 6f34 aa18 aab4 0000 a484 2ecc 386c
0602200  37f0 3cf4 242c 0000 000b 4414 0000 0034 000a fff0 b27c b66c 0000 029d 7fff ffff 000a edc0 0200 0db5 0400 242d 0000 3fef
0602260  0000 001b 0000 3e1f 0000 21cf 0000 315f 000b 0230 2938 002c 000a ed80 4e1c 0000 0000 000b 2520 4740 3050 33bc 4240 0000
0602340  0000 000b 6e74 3130 2420 0000 000b 4064 2954 0038 0002 438a 45d0 46d8 4754 33f4 37dc 379c 6e74 3d48 3ba0 0000 000b 4064
0602420  0018 aa50 aaf0 ffff ac08 2ecc 3858 37dc 242c 0000 000b 4414 0000 0034 000a ed24 b27c b66c 0000 029e 7fff ffff 000a ee98
0602500  0200 0db5 0400 242d 0000 3ff7 0000 0013 0000 3e1f 0000 21cf 0000 315f 000c a034 2c78 002e 0002 438a 370c 0018 2520 4740
0602560  344c 41fc 0000 0003 35c8 35b0 0018 247c 000b 4480 0014 3d00 4a7c 000c 723c 37c7 002e 7e4e 2120 6368 6172 735f 746f 5f73
0602640  7472 6561 6d2f 323a 2062 6164 2043 6861 7273 2061 7267 756d 656e 7420 7e77 7e6e 0000 0243 000b b020 28c4 0038 000b 44e0
0602720  45c4 4700 477c 47f8 001c 33a0 320c 3788 6f34 aa18 aab4 0000 a484 2ecc 3984 0018 001c 38e8 386c 37f0 3cf4 234c 000b 44d0
0603000  0000 0034 000a edc0 b27c b66c 0000 029f 7fff ffff 000a efd0 0200 0db5 0400 242d 0000 3fff 0000 0013 0000 3e1f 0000 21cf
0603060  0000 315f 000c b0d8 2938 0034 000a eefc 4e1c 0000 0000 000b 2520 4754 47d0 4864 0018 3050 33a0 41d4 0000 000b 6e74 38e8
0603140  386c 37f0 3cf4 234c 000b 4480 2954 0050 0002 438a 45e8 001c 46d8 4754 47f8 0024 4864 0018 3410 0020 37dc 37c4 001c 6e74
0603220  3468 3894 0024 37f0 40b4 0020 000b 4480 0020 aa88 001c aaf0 ffff ac08 3968 0018 3d9c 3858 37dc 234c 000b 44d0 2c78 007c
0603300  0002 438a 45e8 001c 46ec 3588 37f0 247c 000b 8b3c 0020 32b8 24d0 0000 0008 bafc 0020 39f8 0008 e17c 0020 2e7c ae30 2ba0
0603360  0020 001e 3af4 001c 0008 b67c 001c aa6c 2e98 3280 4e1c 0000 0000 000b 2c88 000e 2c58 3280 4e1c 0000 0000 0003 40f4 0000
0603440  0008 e17c 0014 39f8 0008 b95c 0010 aa18 aab4 0001 a168 22a0 0000 0034 000a ee98 b27c b66c 0000 02a0 7fff ffff 000b 0298
0603520  0200 0db5 0400 242d 0000 4007 0000 0013 0000 3e1f 0000 21cf 0000 315f 000a a564 2c78 007c 0002 438a 45e8 001c 3574 332c
0603600  24d0 0000 000b 8b3c 0020 32b8 24d0 0000 0008 bafc 0020 39f8 0008 e17c 0020 2e7c ae30 2ba0 0020 001e 3af4 001c 0008 b67c
0603660  001c aa6c 2e98 3280 4e1c 0000 0000 000b 2c88 000e 2c58 3280 4e1c 0000 0000 0003 40f4 0000 0008 e17c 0014 4078 0008 b95c
0603740  0010 aa18 aab4 0001 a168 22a0 0000 0034 000b b4f8 b27c b66c 0000 02a1 7fff ffff 000c 8f60 0200 0db5 0400 24ad 0000 1d17
0604020  0000 001b 0000 3e1f 0000 3a8f 0000 315f 000c b004 2c78 0096 0002 438a 2520 46d8 319c 33f4 4254 0000 0000 001b 24d0 0000
0604100  000b ae54 0024 32f0 001c 247c 0008 bafc 0024 3aa0 0008 e17c 0024 2e7c ae74 0020 2ba0 0024 0028 39f8 0008 d89c 0024 42ac
0604160  ffff fffb 0008 c23c 0024 aa88 0020 2e98 32b8 4c70 0000 000b 2c88 000e 2c58 32b8 4e1c 0000 0000 0003 40b4 001c 0008 e17c
0604240  001c 40a0 0008 b95c 0018 aa50 aab4 0001 a168 3d00 4a7c 000c 723c f13e 002c 2f68 6f6d 652f 6f73 6173 322f 622f 7175 696e
0604320  7475 732f 7077 312e 312f 6c69 6272 6172 792f 6572 726e 6f2e 706c 00e3 0034 2f68 6f6d 652f 6f73 6173 322f 622f 7175 696e
0604400  7475 732f 6765 6e65 7269 632f 7170 6c69 6232 2e35 2f6c 6962 7261 7279 2f65 7272 6e6f 00a3 000b b0c4 0000 0000 27f0 0074
0604460  000b af68 45e8 0020 4714 4740 3410 001c 4254 0000 0000 0003 3af4 0020 000b aef8 0024 2ecc 33d8 3818 3af4 001c 000b af18
0604540  0024 aa50 aab4 0000 a260 3894 001c 3804 3af4 0020 000b af38 0020 aa88 001c aa6c 9d88 ac4c 427c 0000 0000 000b 33bc 408c
0604620  000b af58 0014 3d30 2420 0000 0008 e43c 0000 3aa7 b328 f234 000b 8e08 0000 0000 0000 002c 000a d378 b27c b66c 0000 0023
0604700  7fff ffff 000a d00c 0200 0db5 0200 2f35 0000 381f 0000 0233 0000 315f 0000 381f b328 b66c 000a f24c 0000 0000 000c 1434
0604760  0000 0000 000a 3a18 0000 0000 0005 6669 6c65 7300 0000 002c 000a e7ec b27c b66c 0000 0033 7fff ffff 000a f2e9 0200 0db5
0605040  0200 224d 0000 381f 0000 3287 0000 315f 0011 696e 6974 6961 6c69 7a65 5f76 616c 7565 7300 0007 6465 7374 726f 7900 1cec
0605120  0000 002c 000a f2e8 b4f0 b4e4 0000 0032 7fff ffff 0008 bf1d 0000 01fc 0000 0049 000a d0ac 0002 438a 0018 5574 0000 381f
0605200  b328 f301 000a f2a0 0000 0000 0011 fae4 000d a774 0010 f3f4 000c 04a8 000a 3a28 0000 0000 002e 2f68 6f6d 652f 6f73 6173
0605260  322f 622f 7175 696e 7475 732f 7077 312e 312f 6c69 6272 6172 792f 7072 6f77 696e 646f 7773 0000 37ff 0031 2f68 6f6d 652f
0605340  6f73 6173 322f 622f 7175 696e 7475 732f 7077 312e 312f 6c69 6272 6172 792f 7072 6f77 696e 646f 7773 2e70 6c00 0000 002c
0605420  000a f790 b27c b66c 0000 01f6 7fff ffff 000b 8d14 0200 0db5 0200 2f35 0000 38ef 0000 026b 0000 315f 0000 002c 000d d97c
0605500  b27c b66c 0000 044e 7fff ffff 000d 8824 0200 0db5 0200 224d 0000 47a7 0000 2287 0000 315f 000e 6c69 7374 5f74 6f5f 6269
0605560  6e61 7279 0000 315f 0000 002c 000a f7bc b27c b66c 0000 01fc 7fff ffff 000a d3a4 0200 0db5 0200 224d 0000 38ef 0000 3287
0605640  0000 315f 0010 7072 6f74 616c 6b5f 7574 696c 732e 706c 0000 0011 6f70 6572 6174 6f72 735f 616e 645f 6964 7300 27f0 0014
0605720  000b 0238 4e1c 0000 0000 0007 54a8 228c 000a f468 0000 002c 000b e150 b27c b66c 0000 01ff 7fff ffff 000b 08a8 0200 0db5
0606000  0200 24bd 0000 3287 0000 3a8f 0000 315f b464 20e0 000a f480 000c 1f98 0011 12e8 0200 65c7 0000 3287 0000 0008 000a f7f4
0606060  000a f7f4 0001 0069 0000 0000 2b24 0000 0002 438a 000b 5c4e 2c78 0038 0002 438a 45b8 46ec 9300 93a8 0008 2330 0008 cf7c
0606140  2e7c adec 2ba0 0010 0010 39a4 0008 d33c 0018 aa50 2e98 22a0 2c58 2330 0008 cf7c 002a 2f68 6f6d 652f 6f73 6173 322f 622f
0606220  7175 696e 7475 732f 7077 312e 312f 6c69 6272 6172 792f 6374 7970 6573 0063 6828 002d 2f68 6f6d 652f 6f73 6173 322f 622f
0606300  7175 696e 7475 732f 7077 312e 312f 6c69 6272 6172 792f 6374 7970 6573 2e70 6c00 0035 2f68 6f6d 652f 6f73 6173 322f 622f
```

```
0606360  7175 696e 7475 732f 6765 6e65 7269 632f 7170 6c69 6232 2e35 2f6c 6962 7261 7279 2f63 7479 7065 7300 0038 2f68 6f6d 652f
0606440  6f73 6173 322f 622f 7175 696e 7475 732f 6765 6e65 7269 632f 7170 6c69 6232 2e35 2f6c 6962 7261 7279 2f63 7479 7065 732e
0606520  706c 0044 002a 2f68 6f6d 652f 6f73 6173 322f 622f 7175 696e 7475 732f 7077 312e 312f 6c69 6272 6172 792f 6c69 6e65 696f
0606600  0073 2920 002d 2f68 6f6d 652f 6f73 6173 322f 622f 7175 696e 7475 732f 7077 312e 312f 6c69 6272 6172 792f 6c69 6e65 696f
0606660  2e70 6c00 0035 2f68 6f6d 652f 6f73 6173 322f 622f 7175 696e 7475 732f 6765 6e65 7269 632f 7170 6c69 6232 2e35 2f6c 6962
0606740  7261 7279 2f6c 696e 6569 6f00 0038 2f68 6f6d 652f 6f73 6173 322f 622f 7175 696e 7475 732f 6765 6e65 7269 632f 7170 6c69
0607020  6232 2e35 2f6c 6962 7261 7279 2f6c 696e 6569 6f2e 706c 0073 0029 2f68 6f6d 652f 6f73 6173 322f 622f 7175 696e 7475 732f
0607100  7077 312e 312f 6c69 6272 6172 792f 6669 6c65 7300 002c 2f68 6f6d 652f 6f73 6173 322f 622f 7175 696e 7475 732f 7077 312e
0607160  312f 6c69 6272 6172 792f 6669 6c65 732e 706c 0062 0034 2f68 6f6d 652f 6f73 6173 322f 622f 7175 696e 7475 732f 6765 6e65
0607240  7269 632f 7170 6c69 6232 2e35 2f6c 6962 7261 7279 2f66 696c 6573 0063 0037 2f68 6f6d 652f 6f73 6173 322f 622f 7175 696e
0607320  7475 732f 6765 6e65 7269 632f 7170 6c69 6232 2e35 2f6c 6962 7261 7279 2f66 696c 6573 2e70 6c00 0a0a 0000 002c 000c 2108
0607400  b27c b66c 0000 0202 7fff ffff 000a f3a4 0200 0db5 0200 2f35 0000 3e3f 0000 0273 0000 315f 0000 002c 000c 2134 b27c b66c
0607460  0000 0244 7fff ffff 000a f410 0200 0db5 0200 224d 0000 3e3f 0000 3e0f 0000 315f 2c78 0012 0002 438a 4e1c 0000 0000 3fa7
0607540  228c 0000 2cac 01d0 0002 438a 2ca0 b66c 0000 0000 0000 0001 000a f45c 000b 0238 000b 0242 000a f470 0012 5534 000a 2c7c
0607620  0000 002c 000b 8e04 b27c b66c 0000 0206 7fff ffff 000c 21a0 0200 0db5 0200 284d 0000 3e0f 0000 3e3f 0000 315f 0000 0034
0607700  000b 8f9c b27c b66c 0000 0207 7fff ffff 000a f888 0200 0db5 0400 242d 0000 3e87 0000 000b 0000 3e0f 0000 21cf 0000 315f
0607760  0000 0034 000a f854 b27c b66c 0000 0208 7fff ffff 000a f8bc 0200 0db5 0400 242d 0000 3e8f 0000 000b 0000 3e0f 0000 21cf
0610040  0000 315f 0000 0034 000a f888 b27c b66c 0000 0209 7fff ffff 000a f8f0 0200 0db5 0400 242d 0000 3e97 0000 000b 0000 3e0f
0610120  0000 21cf 0000 315f 0000 0034 000a f8bc b27c b66c 0000 020a 7fff ffff 000a f924 0200 0db5 0400 242d 0000 3e9f 0000 000b
0610200  0000 3e0f 0000 21cf 0000 315f 0000 0034 000a f8f0 b27c b66c 0000 020b 7fff ffff 000a f958 0200 0db5 0400 242d 0000 3ea7
0610260  0000 000b 0000 3e0f 0000 21cf 0000 315f 0000 0034 000a f924 b27c b66c 0000 020c 7fff ffff 000a f98c 0200 0db5 0400 242d
0610340  0000 3eaf 0000 000b 0000 3e0f 0000 21cf 0000 315f 0000 0034 000a f958 b27c b66c 0000 020d 7fff ffff 000a f9c0 0200 0db5
0610420  0400 242d 0000 3eb7 0000 000b 0000 3e0f 0000 21cf 0000 315f 0000 0034 000a f98c b27c b66c 0000 020e 7fff ffff 000a f9f4
0610500  0200 0db5 0400 242d 0000 3ebf 0000 000b 0000 3e0f 0000 21cf 0000 315f 0000 0034 000a f9c0 b27c b66c 0000 020f 7fff ffff
0610560  000a fa28 0200 0db5 0400 242d 0000 3ebf 0000 0013 0000 3e0f 0000 21cf 0000 315f 0000 0034 000a f9f4 b27c b66c 0000 0210
0610640  7fff ffff 000a fa5c 0200 0db5 0400 242d 0000 3ebf 0000 001b 0000 3e0f 0000 21cf 0000 315f 0000 0034 000a fa28 b27c b66c
0610720  0000 0211 7fff ffff 000a fa90 0200 0db5 0400 242d 0000 3ec7 0000 000b 0000 3e0f 0000 21cf 0000 315f 0000 0034 000a fa5c
0611000  b27c b66c 0000 0212 7fff ffff 000a fac4 0200 0db5 0400 242d 0000 3ecf 0000 000b 0000 3e0f 0000 21cf 0000 315f 0000 0034
0611060  000a fa90 b27c b66c 0000 0213 7fff ffff 000a faf8 0200 0db5 0400 242d 0000 3ed7 0000 000b 0000 3e0f 0000 21cf 0000 315f
0611140  0000 0034 000a fac4 b27c b66c 0000 0214 7fff ffff 000a fb2c 0200 0db5 0400 242d 0000 3edf 0000 000b 0000 3e0f 0000 21cf
0611220  0000 315f 0000 0034 000a faf8 b27c b66c 0000 0215 7fff ffff 000a fb60 0200 0db5 0400 242d 0000 3ee7 0000 000b 0000 3e0f
0611300  0000 21cf 0000 315f 0000 0034 000a fb2c b27c b66c 0000 0216 7fff ffff 000a fb94 0200 0db5 0400 242d 0000 3eef 0000 000b
0611360  0000 3e0f 0000 21cf 0000 315f 0000 0034 000a fb60 b27c b66c 0000 0217 7fff ffff 000a fbc8 0200 0db5 0400 242d 0000 3ef7
0611440  0000 000b 0000 3e0f 0000 21cf 0000 315f 0000 0034 000a fb94 b27c b66c 0000 0218 7fff ffff 000a fbfc 0200 0db5 0400 242d
0611520  0000 3eff 0000 0013 0000 3e0f 0000 21cf 0000 315f 0000 0034 000a fbc8 b27c b66c 0000 0219 7fff ffff 000a fc30 0200 0db5
0611600  0400 242d 0000 3f07 0000 000b 0000 3e0f 0000 21cf 0000 315f 0000 0034 000a fbfc b27c b66c 0000 021a 7fff ffff 000a fc64
0611660  0200 0db5 0400 242d 0000 3f0f 0000 000b 0000 3e0f 0000 21cf 0000 315f 0000 0034 000a fc30 b27c b66c 0000 021b 7fff ffff
0611740  000a fc98 0200 0db5 0400 242d 0000 3f17 0000 000b 0000 3e0f 0000 21cf 0000 315f 0000 0034 000a fc64 b27c b66c 0000 021c
0612020  7fff ffff 000a fccc 0200 0db5 0400 242d 0000 3f1f 0000 000b 0000 3e0f 0000 21cf 0000 315f 0000 0034 000a fc98 b27c b66c
0612100  0000 021d 7fff ffff 000a fd00 0200 0db5 0400 242d 0000 3f27 0000 000b 0000 3e0f 0000 21cf 0000 315f 0000 0034 000a fccc
0612160  b27c b66c 0000 021e 7fff ffff 000a fd34 0200 0db5 0400 242d 0000 3f2f 0000 000b 0000 3e0f 0000 21cf 0000 315f 0000 0034
0612240  000a fd00 b27c b66c 0000 021f 7fff ffff 000a fd68 0200 0db5 0400 242d 0000 3f37 0000 000b 0000 3e0f 0000 21cf 0000 315f
0612320  0000 0034 000a fd34 b27c b66c 0000 0220 7fff ffff 000a fd9c 0200 0db5 0400 242d 0000 3f3f 0000 0013 0000 3e0f 0000 21cf
0612400  0000 315f 0000 0034 000a fd68 b27c b66c 0000 0221 7fff ffff 000c 21cc 0200 0db5 0400 242d 0000 3f47 0000 0013 0000 3e0f
0612460  0000 21cf 0000 315f 0000 0034 0013 f3ac b27c b66c 0000 0ec2 7fff ffff 000a fe04 0200 0db5 0400 242d 0000 70af 0000 000b
0612540  0000 70af 0000 21cf 0000 315f 0000 0034 000a fdd0 b27c b66c 0000 0ec3 7fff ffff 0014 3708 0200 0db5 0400 242d 0000 70af
0612620  0000 0013 0000 70af 0000 21cf 0000 315f 27f0 0018 0015 85dc 5d10 0000 0300 70af 5f78 50f0 0000 712f 0000 0034 000a d43c
0612700  b27c b66c 0000 0294 7fff ffff 000a fe84 0200 0db5 0400 242d 0000 3fb7 0000 001b 0000 3e1f 0000 21cf 0000 315f 0000 0034
0612760  000a fe50 b27c b66c 0000 0295 7fff ffff 000a feb8 0200 0db5 0400 242d 0000 3fbf 0000 0003 0000 3e1f 0000 21cf 0000 315f
0613040  0000 0034 000a fe84 b27c b66c 0000 0296 7fff ffff 000a feec 0200 0db5 0400 242d 0000 3fc7 0000 0013 0000 3e1f 0000 21cf
0613120  0000 315f 0000 0034 000a feb8 b27c b66c 0000 0297 7fff ffff 000a ff20 0200 0db5 0400 242d 0000 3fcf 0000 000b 0000 3e1f
0613200  0000 21cf 0000 315f 0000 0034 000a feec b27c b66c 0000 0298 7fff ffff 000a ff54 0200 0db5 0400 242d 0000 3fd7 0000 000b
0613260  0000 3e1f 0000 21cf 0000 315f 0000 0034 000a ff20 b27c b66c 0000 0299 7fff ffff 000a ff88 0200 0db5 0400 242d 0000 3fdf
0613340  0000 000b 0000 3e1f 0000 21cf 0000 315f 0000 0034 000a ff54 b27c b66c 0000 029a 7fff ffff 000a ffbc 0200 0db5 0400 242d
0613420  0000 3fdf 0000 0013 0000 3e1f 0000 21cf 0000 315f 0000 0034 000a ff88 b27c b66c 0000 029b 7fff ffff 000a fff0 0200 0db5
```

| | | | | | | | | | | | | | | | | | | | | | | | | |
|---|---|---|---|---|---|---|---|---|---|---|---|---|---|---|---|---|---|---|---|---|---|---|---|---|
| 0613500 | 0400 | 242d | 0000 | 3fe7 | 0000 | 000b | 0000 | 3e1f | 0000 | 21cf | 0000 | 315f | 0000 | 0034 | 000a | ffbc | b27c | b66c | 0000 | 029c | 7fff | ffff | 000a | ed24 |
| 0613560 | 0200 | 0db5 | 0400 | 242d | 0000 | 3fe7 | 0000 | 0013 | 0000 | 3e1f | 0000 | 21cf | 0000 | 315f | 000f | 8ddc | 000a | 1e9c | 000c | 4aa4 | 000c | 4adc | 0000 | 0038 |
| 0613640 | 000d | 197c | b27c | b66c | 0000 | 04b1 | 7fff | ffff | 000b | 3708 | 0200 | 0db5 | 0300 | 22e5 | 0000 | 0001 | 0000 | 4b5f | 0000 | 0007 | 0000 | 0007 | 0000 | 4ae7 |
| 0613720 | 0000 | 315f | 2c78 | 0084 | 0002 | 438a | 45b8 | 46ec | 9300 | 9afc | 001e | aa18 | aab4 | 0030 | a3ec | aa18 | aab4 | 0039 | a538 | aa18 | aab4 | 0030 | 9db0 | af48 |
| 0614000 | 723c | 9314 | 9afc | 001e | aa34 | aab4 | 0000 | a3ec | aa34 | aab4 | 0009 | a538 | aa34 | aab4 | 0030 | 9d88 | af34 | 723c | 9300 | 9318 | 002e | 9314 | 93a8 | 0028 |
| 0614060 | 4268 | 0000 | 0000 | 004b | 4254 | 0000 | 0000 | 0003 | 3ba0 | 0300 | 000c | 4614 | 0014 | aa34 | aab4 | 0030 | 9d88 | af34 | 723c | c5a8 | 000b | 0330 | 0000 | 0038 |
| 0614140 | b27c | b66c | 0000 | 0b20 | 0000 | 0b83 | 000b | 0448 | 0200 | 0db5 | 0500 | 1cdd | 0000 | 651f | 0000 | 000b | 0000 | 3287 | 0093 | ba63 | 0000 | 034b | 0000 | 315f |
| 0614220 | 2c78 | 0044 | 0002 | 438a | 45dc | 46d8 | 4754 | 41fc | 0000 | 0123 | 4254 | 0000 | 0000 | 0013 | 3b4c | 0000 | 000c | 4614 | 001c | 3348 | 3c48 | 0000 | 000c | 45ac |
| 0614300 | 0018 | aa50 | aab4 | 003f | 9f24 | af48 | aa34 | aa18 | a354 | 723c | 0037 | 2f68 | 6f6d | 652f | 6f73 | 6173 | 322f | 622f | 7175 | 696e | 7475 | 732f | 6765 | 6e65 |
| 0614360 | 7269 | 632f | 7170 | 6c69 | 6232 | 2e35 | 2f6c | 6962 | 7261 | 7279 | 2f65 | 7272 | 6e6f | 2e70 | 6c00 | 01d8 | 0000 | 002c | 000c | a3e4 | b27c | b66c | 0000 | 02a3 |
| 0614440 | 7fff | ffff | 000a | a534 | 0200 | 0db5 | 0200 | 2f35 | 0000 | 402f | 0000 | 028b | 0000 | 315f | 000f | 6f70 | 6572 | 6174 | 6f72 | 5f61 | 6e64 | 5f69 | 6400 | ffff |
| 0614520 | 2c78 | 0018 | 0002 | 438a | 45b8 | 39a4 | 0012 | 0508 | 0010 | 2340 | 0012 | 73cc | 0000 | 002c | 000c | a568 | b27c | b66c | 0000 | 02b2 | 7fff | ffff | 000c | 2134 |
| 0614600 | 0200 | 0db5 | 0200 | 224d | 0000 | 402f | 0000 | 400f | 0000 | 315f | 2c78 | 0012 | 0002 | 438a | 4e1c | 0000 | 0000 | 466f | 228c | 0000 | 2954 | 0024 | 0002 | 438a |
| 0614660 | 56f8 | 671c | 682c | 5758 | 6750 | 6a00 | 24d0 | 0000 | 000b | 09b0 | 0014 | 2330 | 000a | f4bc | 0012 | 54c4 | 000a | 38b8 | 0000 | 002c | 000a | e620 | b27c | b66c |
| 0614740 | 0000 | 02a7 | 7fff | ffff | 000c | 6b80 | 0200 | 0db5 | 0200 | 284d | 0000 | 400f | 0000 | 402f | 0000 | 315f | 0000 | 0034 | 000a | efd0 | b27c | b66c | 0000 | 02a8 |
| 0615020 | 7fff | ffff | 000b | 02cc | 0200 | 0db5 | 0400 | 242d | 0000 | 400f | 0000 | 0013 | 0000 | 400f | 0000 | 21cf | 0000 | 315f | 0000 | 0034 | 000b | 0298 | b27c | b66c |
| 0615100 | 0000 | 02a9 | 7fff | ffff | 000b | 0300 | 0200 | 0db5 | 0400 | 242d | 0000 | 400f | 0000 | 001b | 0000 | 400f | 0000 | 21cf | 0000 | 315f | 0000 | 0034 | 000b | 02cc |
| 0615160 | b27c | b66c | 0000 | 02aa | 7fff | ffff | 000c | 6bac | 0200 | 01b5 | 0400 | 242d | 0000 | 4037 | 0000 | 0013 | 0000 | 400f | 0000 | 21cf | 0000 | 315f | 000b | 0444 |
| 0615240 | 0000 | 0094 | 4e1c | 0000 | 0000 | 4bbf | 5d7c | 0000 | 0200 | 4bbf | 6160 | 5b58 | 0100 | 0ab7 | 4b8c | 0000 | 0000 | 229f | 56f8 | 671c | 5370 | 5aec | 0100 | 0ad7 |
| 0615320 | 4b8c | 0000 | 0000 | 229f | 228c | 002c | 000b | 0444 | 0000 | 0054 | 4e1c | 0000 | 0000 | 4bc7 | 5d7c | 0000 | 0300 | 4bc7 | 6784 | 6160 | 5de8 | 0000 | 0100 | 0ab7 |
| 0615400 | 4b8c | 0000 | 0000 | 229f | 5d7c | 0000 | 0100 | 0ab7 | 4b8c | 0000 | 0000 | 229f | 56f8 | 671c | 5370 | 5aec | 0100 | 0ad7 | 4b8c | 0000 | 0000 | 229f | 228c | 7943 |
| 0615460 | 000f | 4c00 | 000e | 86d4 | 28c4 | 0048 | 000b | 0410 | 2520 | 4700 | 33bc | 3310 | 24d0 | 0000 | 000c | aefc | 0018 | 2ecc | 4550 | 6d94 | 5370 | 4538 | 6d50 | 6bb4 |
| 0615540 | 4568 | 6d0c | 6b74 | 41e8 | 0000 | 4047 | 4300 | 0000 | 0000 | 328f | 0008 | c11c | 000c | 234c | 0008 | b05c | 2954 | 0030 | 0002 | 438a | 2520 | 4580 | 6b88 | 5370 |
| 0615620 | 4568 | 6b48 | 6c34 | 41e8 | 0000 | 404f | 4300 | 0000 | 0000 | 328f | 0008 | c11c | 000c | 234c | 0008 | b05c | 000b | 04ec | 0000 | 0038 | b27c | b66c | 0000 | 0b21 |
| 0615700 | 0000 | 0b84 | 000b | 04f0 | 0200 | 0db5 | 0500 | 1cdd | 0000 | 6527 | 0000 | 000b | 0000 | 3287 | 0093 | bcc3 | 0000 | 034b | 0000 | 315f | 28c4 | 0044 | 000b | 04bc |
| 0615760 | 2520 | 4700 | 33bc | 3310 | 24d0 | 0000 | 000c | aefc | 0018 | 2ecc | 4550 | 6d94 | 5370 | 4538 | 6d50 | 6bb4 | 4568 | 6d0c | 6b74 | 41e8 | 0000 | 4047 | 4300 | 0000 |
| 0616040 | 0000 | 328f | 0008 | c11c | 000c | c5a8 | 2954 | 002c | 0002 | 438a | 2520 | 4580 | 6b88 | 5370 | 4568 | 6b48 | 6c34 | 41e8 | 0000 | 404f | 4300 | 0000 | 0000 | 328f |
| 0616120 | 0008 | c11c | 000c | c5a8 | 000b | 0560 | 0000 | 0038 | b27c | b66c | 0000 | 0b22 | 0000 | 0b85 | 000a | 2c4c | 0200 | 0db5 | 0500 | 1cdd | 0000 | 5f97 | 0000 | 000b |
| 0616200 | 0000 | 3287 | 0090 | 0023 | 0000 | 034b | 0000 | 315f | b464 | 44f0 | 000c | 8f98 | 0016 | b080 | 2c78 | 0030 | 0002 | 438a | 45c4 | 46d8 | 3348 | 39f8 | 000c | 45ac |
| 0616260 | 0018 | aa50 | aab4 | 0200 | 9f24 | aab4 | 0004 | 9fe8 | ac08 | aa34 | a858 | 9d88 | af34 | 723c | 000b | 05c8 | 0000 | 0038 | b27c | b66c | 0000 | 0b35 | 0000 | 0b98 |
| 0616340 | 000b | 471c | 0200 | 0db5 | 0500 | 1cdd | 0000 | 65a7 | 0000 | 001b | 0000 | 3287 | 0059 | f603 | 0000 | 034b | 0000 | 315f | 2c78 | 0030 | 0002 | 438a | 45c4 | 46d8 |
| 0616420 | 3348 | 39f8 | 000c | 45ac | 0018 | aa50 | aab4 | 0400 | 9f24 | aab4 | 0005 | 9fe8 | ac08 | aa34 | a858 | 9db0 | af34 | 723c | 000b | 0634 | 0000 | 0038 | b27c | b66c |
| 0616500 | 0000 | 0b37 | 0000 | 0b9a | 000b | 4824 | 0200 | 0db5 | 0500 | 1cdd | 0000 | 65bf | 0000 | 001b | 0000 | 3287 | 005a | 3ae3 | 0000 | 034b | 0000 | 315f | 2c78 | 0032 |
| 0616560 | 0002 | 438a | 45d0 | 46d8 | 4754 | 9328 | 9afc | 0010 | aa18 | aa50 | a538 | aa50 | aa34 | a538 | 22a0 | 9328 | 93a8 | 000a | 23fc | 0000 | 000c | 4634 | c5a8 | 2021 |
| 0616640 | 000b | 06a8 | 0000 | 0040 | 4e1c | 0000 | 0000 | 4c2f | 5d7c | 0000 | 0200 | 4c2f | 6160 | 5b58 | 0100 | 0ab7 | 4b8c | 0000 | 0000 | 229f | 56f8 | 671c | 5370 | 5aec |
| 0616720 | 0100 | 0ad7 | 4b8c | 0000 | 0000 | 229f | 228c | 07c4 | 002f | 4164 | 6472 | 6573 | 7320 | 6661 | 6d69 | 6c79 | 206e | 6f74 | 2073 | 7570 | 706f | 7274 | 6564 | 2062 |
| 0617000 | 7920 | 7072 | 6f74 | 6f63 | 6f6c | 2066 | 616d | 696c | 7900 | b414 | 000b | 08d0 | 0000 | 01a8 | 4e1c | 0000 | 0000 | 4bdf | 5d7c | 0000 | 0200 | 4bdf | 6160 | 5b58 |
| 0617060 | 0100 | 0ab7 | 4b8c | 0000 | 0000 | 229f | 56f8 | 671c | 5370 | 5aec | 0100 | 0ad7 | 4b8c | 0000 | 0000 | 229f | 228c | b7a4 | 000b | 0728 | 0000 | 0040 | 4e1c | 0000 |
| 0617140 | 0000 | 4be7 | 5d7c | 0000 | 0200 | 4be7 | 6160 | 5b58 | 0100 | 0ab7 | 4b8c | 0000 | 0000 | 229f | 56f8 | 671c | 5370 | 5aec | 0100 | 0ad7 | 4b8c | 0000 | 0000 | 229f |
| 0617220 | 228c | b414 | 000b | 077c | 0000 | 0054 | 4e1c | 0000 | 0000 | 4bef | 5d7c | 0000 | 0300 | 4bef | 6784 | 6160 | 5de8 | 0000 | 0100 | 0ab7 | 4b8c | 0000 | 0000 | 253f |
| 0617300 | 5d7c | 0000 | 0100 | 0ab7 | 4b8c | 0000 | 0000 | 229f | 56f8 | 671c | 5370 | 5aec | 0100 | 0ad7 | 4b8c | 0000 | 0000 | 229f | 228c | b8c4 | 000b | 07bc | 0000 | 0040 |
| 0617360 | 4e1c | 0000 | 0000 | 4bf7 | 5d7c | 0000 | 0200 | 4bf7 | 6160 | 5b58 | 0100 | 0ab7 | 4b8c | 0000 | 0000 | 229f | 56f8 | 671c | 5370 | 5aec | 0100 | 0ad7 | 4b8c | 0000 |
| 0617440 | 0000 | 229f | 228c | bd18 | 000b | 07fc | 0000 | 0040 | 4e1c | 0000 | 0000 | 4bff | 5d7c | 0000 | 0200 | 4bff | 6160 | 5b58 | 0100 | 0ab7 | 4b8c | 0000 | 0000 | 229f |
| 0617520 | 56f8 | 671c | 5370 | 5aec | 0100 | 0ad7 | 4b8c | 0000 | 0000 | 229f | 228c | 0070 | 000b | 08d0 | 0000 | 0054 | 4e1c | 0000 | 0000 | 4c07 | 5d7c | 0000 | 0300 | 4c07 |
| 0617600 | 6784 | 6160 | 5de8 | 0000 | 0100 | 0ab7 | 4b8c | 0000 | 0000 | 253f | 5d7c | 0000 | 0100 | 0ab7 | 4b8c | 0000 | 0000 | 229f | 56f8 | 671c | 5370 | 5aec | 0100 | 0ad7 |
| 0617660 | 4b8c | 0000 | 0000 | 229f | 228c | 5120 | 000f | 6f72 | 645f | 6465 | 6c5f | 656c | 656d | 656e | 7400 | 18dc | 0000 | 002c | 000d | 2484 | b27c | b66c | 0000 | 044f |
| 0617740 | 7fff | ffff | 000d | 49bc | 0200 | 0db5 | 0200 | 24bd | 0000 | 3287 | 0000 | 2287 | 0000 | 315f | 000e | 6269 | 6e61 | 7279 | 5f74 | 6f5f | 6c69 | 7374 | 0000 | 0000 |
| 0620020 | 0000 | 002c | 000a | f47c | b27c | b66c | 0000 | 0245 | 7fff | ffff | 000c | 2174 | 0200 | 0db5 | 0200 | 24bd | 0000 | 3287 | 0000 | 3e0f | 0000 | 315f | 000b | 09d0 |
| 0620100 | 0000 | 00d4 | 4e1c | 0000 | 0000 | 4c0f | 5d7c | 0000 | 0200 | 4c0f | 6160 | 5b58 | 0100 | 0ab7 | 4b8c | 0000 | 0000 | 229f | 56f8 | 671c | 5370 | 5aec | 0100 | 0ad7 |
| 0620160 | 4b8c | 0000 | 0000 | 229f | 228c | 0000 | 000b | 0950 | 0000 | 0040 | 4e1c | 0000 | 0000 | 4c4f | 5d7c | 0000 | 0200 | 4c4f | 6160 | 5b58 | 0100 | 0ab7 | 4b8c | 0000 |
| 0620240 | 0000 | 229f | 56f8 | 671c | 5370 | 5aec | 0100 | 0ad7 | 4b8c | 0000 | 0000 | 229f | 228c | 5120 | 000b | 09d0 | 0000 | 0054 | 4e1c | 0000 | 0000 | 4d37 | 5d7c | 0000 |
| 0620320 | 0300 | 4d37 | 6784 | 6160 | 5de8 | 0000 | 0100 | 0ab7 | 4b8c | 0000 | 0000 | 253f | 5d7c | 0000 | 0100 | 0ab7 | 4b8c | 0000 | 0000 | 229f | 56f8 | 671c | 5370 | 5aec |
| 0620400 | 0100 | 0ad7 | 4b8c | 0000 | 0000 | 229f | 228c | 6a50 | 0011 | 1328 | 0200 | 65cf | 0000 | 3287 | 0000 | 0008 | 000b | 01e0 | 000b | 01e0 | 0001 | 0069 | 0000 | 0000 |
| 0620460 | 29c8 | f4d0 | 000b | 4630 | 000b | 6c3a | 000b | 1064 | 0000 | 0080 | 4e1c | 0000 | 0000 | 4c17 | 5d7c | 0000 | 0200 | 4c17 | 6160 | 5b58 | 0100 | 0ab7 | 4b8c | 0000 |
| 0620540 | 0000 | 229f | 56f8 | 671c | 5370 | 5aec | 0100 | 0ad7 | 4b8c | 0000 | 0000 | 229f | 228c | 55a0 | 000b | 1064 | 0000 | 0040 | 4e1c | 0000 | 0000 | 4c37 | 5d7c | 0000 |

```
0620620 0200 4c37 6160 5b58 0100 0ab7 4b8c 0000 0000 229f 56f8 671c 5370 5aec 0100 0ad7 4b8c 0000 0000 229f 228c 5720 000f 6c69
0620700 7374 5f74 6f5f 6f72 645f 7365 7400 0000 000c 4b5c 000c 4b98 000c 4bb0 000c 4bd8 000c 4bf0 000c 4c28 000c 4c40 000c 4c58
0620760 000c 4c70 000c 4c88 000c 4ca0 000c 4cb8 000c 4cd0 000c 4ce8 000c 4d00 000c 4d18 000c 4d30 000c 4d48 000c 4d60 000c 4d78
0621040 000c 4d90 000c 4da8 000c 4dc0 000c 4dd8 000c 4df0 000c 4e08 000c 4e20 000c 4e38 000c 4e50 000c 4e68 000c 4e80 000c 4e98
0621120 000c 4eb0 000c 4ec8 000c 4ee0 000c 4ef8 000c 4f10 000c 4f28 000c 4f40 000c 4f58 000c 4f70 000c 4f88 000c 4fa0 000c 4fb8
0621200 000c 4fd0 000c 4fe8 000c 5000 000c 5018 000c 5030 000c 5048 000c 5060 000c 5078 000c 5090 000c 50a8 000c 50c0 000c 50d8
0621260 000c 50f0 000c 5108 000c 5120 000c 5138 000c 5150 000c 5168 000c 5180 000c 5198 000c 51b0 000c 51c8 000c 51e0 000c 51f8
0621340 000c 5210 000c 5228 000c 5240 000c 5258 000c 5270 000c 5288 000c 52a0 000c 52b8 000c 52d0 000c 52e8 000c 5300 000c 5318
0621420 000c 5330 000c 5348 000c 5360 000c 5378 000c 5390 000c 53a8 000c 53c0 000c 53d8 000c 53f0 000c 5408 000c 5420 000c 5438
0621500 000c 5450 000c 5468 000c 5480 000c 5498 000c 54b0 000c 54c8 000c 54e0 000c 54f8 000c 5510 000c 5528 000c 5540 000c 5558
0621560 000c 5570 000c 5588 000c 55a0 000c 55b8 000c 55d0 000c 55e8 000c 5600 000c 5618 000c 5630 000c 5648 000c 5660 000c 5678
0621640 000c 5690 000c 56a8 000c 56c0 000c 56d8 000c 56f0 000c 5708 000c 5720 000c 5738 000c 5750 000c 5768 000c 5780 000c 5798
0621720 000c 57b0 000c 57c8 000c 57e0 000c 57f8 000c 5810 000c 5828 000c 5840 000c 5858 000c 5870 000c 5888 000c 58a0 000c 58b8
0622000 000c 58d0 000c 58e8 000c 5900 000c 5918 000c 5930 000c 5948 000c 5960 000c 5978 000c 5990 000c 59a8 000c 59c0 000c 59d8
0622060 000c 59f0 000c 5a08 000c 5a20 000c 5a38 000c 5a50 000c 5a68 000c 5a80 000c 5a98 000c 5ab0 000c 5ac8 000c 5ae0 000c 5af8
0622140 000c 5b10 000c 5b28 000c 5b40 000c 5b58 000c 5b70 000c 5b88 000c 5ba0 000c 5bb8 000c 5bd0 000c 5be8 000c 5c00 000c 5c18
0622220 000c 5c30 000c 5c48 000c 5c60 000c 5c78 000c 5c90 000c 5ca8 000c 5cc0 000c 5cd8 000c 5cf0 000c 5d08 000c 5d20 000c 5d38
0622300 000c 5d50 000c 5d68 000c 5d80 000c 5d98 000c 5db0 000c 5dc8 000c 5de0 000c 5df8 000c 5e10 000c 5e28 000c 5e40 000c 5e58
0622360 000c 5e70 000c 5e88 000c 5ea0 000c 5eb8 000c 5ed0 000c 5ee8 000c 5f00 000c 5f18 000c 5f30 000c 5f48 000c 5f60 000c 5f78
0622440 000c 5f90 000c 5fa8 000c 5fc0 000c 5fd8 000c 5ff0 000c 6008 000c 6020 000c 6038 000c 6050 000c 6068 000c 6080 000c 6098
0622520 000c 60b0 000c 60c8 000c 60e0 000c 60f8 000c 6110 000c 6128 000c 6140 000c 6158 000c 6170 000c 6188 000c 61a0 000c 61b8
0622600 000c 61d0 000c 61e8 000c 6200 000c 6218 000c 6230 000c 6248 000c 6260 000c 6278 000c 6290 000c 62a8 000c 62c0 000c 62d8
0622660 000c 62f0 000c 6308 000c 6320 000c 6338 000c 6350 000c 6368 000c 6380 000c 6398 000c b118 000c b16c 000c b1b8 000c b1f8
0622740 000c b238 000c b288 000c b2c8 000c b300 000c b33c 000c b374 000c b39c 000c b3d8 000c b414 000c b450 000c b488 000c b4b0
0623020 000c b4e8 000c b520 000c b558 000c b594 000c b5d0 000c b60c 000c b648 000c b670 000c b6b0 000c b6ec 000c b728 000c b760
0623100 000c b7a4 000c b7dc 000c b818 000c b854 000c b888 000c b8c4 000c b900 000c b944 000c b98c 000c b9b4 000c ba00 000c ba4c
0623160 000c ba88 000c bad8 000c bb20 000c bb6c 000c bbb8 000c bc08 000c bc54 000c bc80 000c bcc8 000c bd18 000c bd54 000c bd9c
0623240 000c bdec 000c be3c 000c be84 000c bec8 000c bf10 000c bf54 000c bfa0 000c bff0 000c c030 000c c074 000c c0bc 000c c100
0623320 000c c138 000c c178 000c c1b8 000c c1f8 000c c234 000c c274 000c c2b4 000c c300 000c c344 000c c378 000c c3b8 000c c400
0623400 000c c44c 000c c488 000c c4c8 000c c50c 000c c554 000c c590 000c c5d4 000c c60c 000c c644 000c c688 000c c6c4 000c c704
0623460 000c c750 000c c794 0000 0000 0000 0000 0000 0000 0000 0000 0000 0000 0000 0000 0000 0000 0000 0000 0000 0000 0000 0000
0623540 000c c7d8 000c c820 000c c868 000c c8b8 0000 0000 0000 0000 0000 0000 0000 0000 0000 0000 0000 0000 0000 0000 0000 0000
0623620 0000 0000 0000 0000 0000 0000 0000 0000 0000 0000 0000 0000 0000 0000 0000 0000 0000 0000 0000 0000 0000 0000 0000 0000
0623700 0000 0000 0000 0000 0000 0000 000c c8fc 000b 17e0 c000 0310 4e1c 0000 0000 4c57 5d7c 0000 0200 4c57 6160 5b58 0100 0ab7
0623760 4b8c 0000 0000 229f 56f8 671c 5370 5aec 0100 0ad7 4b8c 0000 0000 229f 228c 6577 000b 10f8 0000 0054 4e1c 0000 0000 4c6f
0624040 5d7c 0000 0300 4c6f 6784 6160 5de8 0000 0100 0ab7 4b8c 0000 0000 229f 5d7c 0000 0100 0ab7 4b8c 0000 0000 229f 56f8 671c
0624120 5370 5aec 0100 0ad7 4b8c 0000 0000 229f 228c 2c20 000b 1138 0000 0040 4e1c 0000 0000 4c1f 5d7c 0000 0200 4c1f 6160 5b58
0624200 0100 0ab7 4b8c 0000 0000 229f 56f8 671c 5370 5aec 0100 0ad7 4b8c 0000 0000 229f 228c 292e 000b 1178 0000 0040 4e1c 0000
0624260 0000 4c3f 5d7c 0000 0200 4c3f 6160 5b58 0100 0ab7 4b8c 0000 0000 229f 56f8 671c 5370 5aec 0100 0ad7 4b8c 0000 0000 229f
0624340 228c 7463 000b 11b8 0000 0040 4e1c 0000 0000 4c5f 5d7c 0000 0200 4c5f 6160 5b58 0100 0ab7 4b8c 0000 0000 229f 56f8 671c
0624420 5370 5aec 0100 0ad7 4b8c 0000 0000 229f 228c 646f 000b 11f8 0000 0040 4e1c 0000 0000 4c27 5d7c 0000 0200 4c27 6160 5b58
0624500 0100 0ab7 4b8c 0000 0000 229f 56f8 671c 5370 5aec 0100 0ad7 4b8c 0000 0000 229f 228c 2061 000b 1238 0000 0040 4e1c 0000
0624560 0000 4c47 5d7c 0000 0200 4c47 6160 5b58 0100 0ab7 4b8c 0000 0000 229f 56f8 671c 5370 5aec 0100 0ad7 4b8c 0000 0000 229f
0624640 228c 6520 000b 1278 0000 0040 4e1c 0000 0000 4c67 5d7c 0000 0200 4c67 6160 5b58 0100 0ab7 4b8c 0000 0000 229f 56f8 671c
0624720 5370 5aec 0100 0ad7 4b8c 0000 0000 229f 228c 7465 000b 12cc 0000 0054 4e1c 0000 0000 4d7f 5d7c 0000 0300 4c8f 6784 6160
0625000 5de8 0000 0100 0ab7 4b8c 0000 0000 229f 5d7c 0000 0100 0ab7 4b8c 0000 0000 253f 56f8 671c 5370 5aec 0100 0ad7 4b8c 0000
0625060 0000 229f 228c 5f70 000b 1320 0000 0054 4e1c 0000 0000 4cff 5d7c 0000 0300 4cff 6784 6160 5de8 0000 0100 0ab7 4b8c 0000
0625140 0000 229f 5d7c 0000 0100 0ab7 4b8c 0000 0000 229f 56f8 671c 5370 5aec 0100 0ad7 4b8c 0000 0000 229f 228c 292c 000b 17e0
0625220 0000 0054 4e1c 0000 0000 4d87 5d7c 0000 0300 4cdf 6784 6160 5de8 0000 0100 0ab7 4b8c 0000 0000 229f 5d7c 0000 0100 0ab7
0625300 4b8c 0000 0000 229f 56f8 671c 5370 5aec 0100 0ad7 4b8c 0000 0000 229f 228c 2929 2954 0030 0002 438a 45d0 46ec 3bf4 0000
0625360 0012 7644 0018 3310 3bf4 0000 0012 017c 0014 3858 320c 3cf4 242c 0000 000b 4864 0014 8c90 0028 2f68 6f6d 652f 6f73 6173
0625440 322f 622f 7175 696e 7475 732f 7077 312e 312f 6c69 6272 6172 792f 6361 6c6c 0034 002b 2f68 6f6d 652f 6f73 6173 322f 622f
0625520 7175 696e 7475 732f 7077 312e 312f 6c69 6272 6172 792f 6361 6c6c 2e70 6c00 315f 0033 2f68 6f6d 652f 6f73 6173 322f 622f
0625600 7175 696e 7475 732f 6765 6e65 7269 632f 7170 6c69 6232 2e35 2f6c 6962 7261 7279 2f63 616c 6c00 0034 0036 2f68 6f6d 652f
0625660 6f73 6173 322f 622f 7175 696e 7475 732f 6765 6e65 7269 632f 7170 6c69 6232 2e35 2f6c 6962 7261 7279 2f63 616c 6c2e 706c
```

```
0625740 0088 b66c 2c78 0020 0002 438a 362c 43c0 0200 0daf 4b8c 0000 0000 3287 6bc8 22bc 0008 b1fc 0008 e18c 0200 1ea7 0000 3287
0626020 0000 0008 000b 14b4 000b 14b4 0041 0000 0000 0000 2c78 0020 0002 438a 362c 43c0 0200 0daf 4b8c 0000 0000 3287 6bc8 22bc
0626100 0008 b6bc 000b 1494 0300 1ea7 0000 3287 0000 000c 000b 14f4 000b 14f4 0041 0000 0000 0000 2c78 0020 0002 438a 3690 43c0
0626160 0200 0daf 4b8c 0000 0000 3287 6c08 22bc 0008 b6dc 000b 14d4 0400 1ea7 0000 3287 0000 0010 000b 1534 000b 1534 0041 0000
0626240 0000 0000 2c78 0028 0002 438a 36f4 0018 447c 0000 0200 0daf 4b8c 0000 0000 3287 6c48 0018 239c 0000 0008 b6fc 000b 1514
0626320 0500 1ea7 0000 3287 0000 0014 000b 157c 000b 157c 0041 0000 0000 0000 2c78 0028 0002 438a 36f4 001c 447c 0000 0200 0daf
0626400 4b8c 0000 0000 3287 6c48 001c 239c 0000 0008 b71c 000b 155c 0600 1ea7 0000 3287 0000 0018 000b 15c4 000b 15c4 0041 0000
0626460 0000 0000 2c78 0028 0002 438a 36f4 0020 447c 0000 0200 0daf 4b8c 0000 0000 3287 6c48 0020 239c 0000 0008 b73c 000b 15a4
0626540 0700 1ea7 0000 3287 0000 001c 000b 160c 000b 160c 0041 0000 0000 0000 2c78 0028 0002 438a 36f4 0024 447c 0000 0200 0daf
0626620 4b8c 0000 0000 3287 6c48 0024 239c 0000 0008 b75c 0008 e48c 0400 2fe7 0000 3287 0000 0010 000b 1654 000b 1654 0041 0000
0626700 0000 0000 2c78 0010 0002 438a 239c 0000 0008 e49c 0000 002c 0008 0478 b27c b66c 0000 0028 7fff ffff 000a aaa0 0200 0db5
0626760 0200 24bd 0000 3287 0000 1ea7 0000 315f b464 33fd 000b 1670 000c 1630 0009 6765 745f 636f 6c6f 7200 0009 6765 745f 7072
0627040 6f74 6f00 000a 6772 6170 6869 6361 6c73 0000 15ad 0005 636f 6c6f 7200 0008 cc2c 0200 3857 0000 3287 0000 0008 000b 1760
0627120 000b 1760 0001 0046 0000 0000 2954 0030 0002 438a 56f8 6420 92d0 9a90 aab4 0000 a8ac a538 a8ac aab4 00ff a538 a874 aaf0
0627200 0001 ac4c 239c 0000 000b aef8 2954 0034 0002 438a 56f8 671c 682c 4768 aa50 aab4 0000 a484 33bc 247c 000b b06c 0018 aa50
0627260 aaf0 ffff ac90 3330 2420 0000 000b af38 0003 7365 6e64 5f69 6e64 6972 6563 7400 2c78 0040 0002 438a 2520 46ec 3348 247c
0627340 000b 17b0 0018 4568 69b0 5fa0 4254 0000 0003 3867 40f4 0000 0008 c31c 0014 3858 4254 0000 0000 386f 2420 0000 0008 c35c
0627420 ffff ffff 0200 385f 0000 3287 0000 0008 000b 182c 000b 182c 0001 0046 0000 0000 000f 6765 745f 6672 6f6d 5f66 6967 7572
0627500 6500 1e17 0005 7072 6f74 6f00 000b 18a0 0000 0038 b27c b66c 0000 0b37 0000 0b9c 000b 18a4 0200 0db5 0500 1cdd 0000 65b7
0627560 0000 0013 0000 3287 005a d5e3 0300 034b 0000 315f 000c 7072 6561 7373 6f63 6961 7465 0000 000b 3fa4 000a 24d0 2c78 0020
0627640 0002 438a 4568 6b88 5fa0 35c8 4240 0000 0000 387f 239c 0000 000b 185c ffff ffff 0300 3877 0000 3287 0000 000c 000b 1b04
0627720 000b 1b04 0001 0046 0000 0000 000a 6765 745f 7374 7269 6e67 0000 0000 0008 cc6c 0300 3887 0000 3287 0000 000c 000b 18f4
0630000 000b 18f4 0001 0046 0000 0000 000b 1a00 0000 0038 b27c b66c 0000 0b3a 0000 0b9d 000b 1a04 0200 0db5 0500 1cdd 0000 65b7
0630060 0000 001b 0000 3287 005a 4323 0000 034b 0000 315f 000c 6e65 775f 7375 6263 6c61 7373 0000 000c 6469 7361 7373 6f63 6961
0630140 7465 0000 2c78 0032 0002 438a 2520 4754 33a0 247c 0008 c21c 0014 2ba0 0014 000e 3774 5aec 0100 2fdf 6d50 723c 2c58 3788
0630220 4a7c 000c 723c 0000 0008 7365 745f 7465 7874 0000 0008 cc8c 0200 388f 0000 3287 0000 0008 000b 199c 000b 199c 0001 0046
0630300 0000 0000 2954 0030 0002 438a 45dc 46ec 4768 3aa0 0012 7644 001c 3310 3c48 0000 0012 017c 0018 386c 37f0 3cf4 242c 0000
0630360 000b 4864 0010 83ec 0000 0000 000a 6174 7472 6962 7574 6573 0000 0000 2c78 0034 0002 438a 2520 46ec 4568 69b0 5fa0 35c8
0630440 4300 0000 0003 30bf 000b 185c 0014 3858 4254 0000 0000 2fdf 2420 0000 0008 dd9c 0009 7365 745f 636f 6c6f 7200 0008 ccac
0630520 0200 3897 0000 3287 0000 0008 000b 1a6c 000b 1a6c 0001 0046 0000 0000 000b 1ad0 0000 0038 b27c b66c 0000 0b3b 0000 0b9e
0630600 000b 1ad4 0200 0db5 0500 1cdd 0000 6557 0000 000b 0000 3287 005a 6523 0000 034b 0000 315f 000a 6e65 775f 6f62 6a65 6374
0630660 0000 0000 0008 ce4c 0200 38ff 0000 38c7 0000 0008 000b 5b74 000b 5b74 0001 0047 0000 0000 0005 6665 7463 6800 2c78 0040
0630740 0002 438a 2520 46ec 3348 247c 000b 17b0 0018 4568 69b0 5fa0 4254 0000 0000 3867 40f4 0000 0008 c31c 0014 3858 4254 0000
0631020 0000 386f 2420 0000 0008 dd9c 0007 6f62 6a65 6374 7300 1a80 000e 7365 6c65 6374 5f62 795f 7479 7065 000b 1ab4 000b 1b58
0631100 0000 0038 b27c b66c 0000 0b3c 0000 0b9f 000b 1b5c 0200 0db5 0500 1cdd 0000 6557 0000 0013 0000 3287 0093 c6c3 0000 034b
0631160 0000 315f 2c78 0030 0002 438a 45c4 3574 4768 33a0 4254 0000 0000 389f 24d0 0000 0008 c31c 0018 386c 37f0 3cf4 242c 0000
0631240 000b 1b44 0008 ccec 0300 38a7 0000 3287 0000 000c 000b 1bb0 000b 1bb0 0001 0046 0000 0000 000b 2350 0000 0038 b27c b66c
0631320 0000 0b3d 0000 0ba0 000b 2354 0200 0db5 0500 1cdd 0000 6557 0000 001b 0000 3287 0057 3ca3 0000 034b 0000 315f 000c 6173
0631400 736f 6369 6174 696f 6e73 0000 27f0 0014 000b 1be0 4e1c 0000 0000 0007 54f8 228c 2cac f34d 0002 438a 2ca0 c99c 0000 0000
0631460 0000 0001 000b 1b9c 000b 1c2c 000b 1c4c 0003 d190 0006 7479 7065 6973 000b 1ba0 28c4 002c 000b 1c2c 56f8 671c 682c 46ec
0631540 57b8 6b74 6a50 35c8 3ba0 0000 000b 1c1c 0018 2ecc 23fc 0000 000b 1b44 0008 cd0c 0200 38af 0000 3287 0000 0008 000b 1cb0
0631620 000b 1cb0 0001 0046 0000 0000 2354 0014 0002 438a 56f8 5fa0 671c 22bc 000b 1b44 2b24 1bfc 0002 438a 000b 1c36 29c8 37ff
0631700 000b 1c40 000b 1bea 000a 636c 6173 735f 6e61 6d65 0003 50fc 2954 0030 0002 438a 45dc 46ec 4768 3aa0 0012 7644 001c 3310
0631760 3c48 0000 0012 017c 0018 386c 37f0 3cf4 242c 0000 000a e794 0010 d9cc 000a 2664 000d 7072 6f74 616c 6b5f 7574 696c 7300
0632040 2c78 001c 0002 438a 362c 36a4 4254 0000 0000 38b7 359c 22bc 0008 c21c 0008 6665 7463 6861 6c6c 00d4 0011 6973 5f70 726f
0632120 7461 6c6b 5f6f 626a 6563 7400 0007 6465 6c76 616c 7300 1cfc 000b 89f4 0008 6465 6c65 6761 7465 0008 0006 6368 616e 6765
0632200 000b 1d14 0009 6173 736f 6369 6174 6500 0007 7072 6f74 616c 6b00 1d2c 0013 7072 6f77 696e 646f 7773 5f75 7469 6c73 2e70
0632260 6c00 af5d 0014 6765 6e65 7269 635f 6173 736f 6369 6174 696f 6e73 0060 0012 6765 6e65 7269 635f 696e 6974 6961 6c69 7a65
0632340 0000 380f 0011 6d61 6b65 5f63 6c61 7373 5f6f 626a 6563 7400 0006 6d66 6574 6368 0000 0000 0009 6e65 775f 636c 6173 7300
0632420 0012 6e65 775f 6765 6e65 7269 635f 6f62 6a65 6374 000b 1a74 000e 7072 6f74 616c 6b5f 6f62 6a65 6374 000b 028c 000f 7072
0632500 6f74 616c 6b5f 6f62 6a65 6374 7300 1dbc 000f 7072 6f77 696e 646f 7773 5f6e 616d 6500 0000 0006 7361 7665 696e 000b 0b82
0632560 0000 38df b328 d378 000a d37c 0000 0000 0000 0007 29c8 3f74 000b b144 000b 4888 b464 1634 000b e21c 0000 0000 0000 38df
0632640 b328 0000 000a d3a8 0000 0000 0000 38c7 b328 1e44 000a d414 0000 0000 0000 38f7 b328 af5d 000a d480 0000 0000 000c 06cd
0632720 0000 0000 0000 38ff b328 0007 000a d4b4 0000 0000 0011 b5f4 000a 3884 0008 ce6c 0200 3907 0000 38c7 0000 0008 000b 5be8
0633000 000b 5be8 0001 0047 0000 0000 0000 3907 b328 1a6c 000a d4e8 0000 0000 0011 b930 000a 3458 0008 ce8c 0400 390f 0000 38c7
```

```
0633060 0000 0010 000b 57b4 000b 57b4 0001 0047 0000 0000 0000 390f b328 daf0 000a d51c 0000 0000 2c78 0044 0002 438a 45b8 46ec
0633140 9300 9410 2e7c a1ec 2ba0 0018 0018 39a4 000d 7d48 0018 aa50 2e98 3858 4368 2340 000b 3ec0 2c58 3858 4368 4538 6d0c 5370
0633220 242c 0030 000b 3ec0 27f0 0014 000b 3764 4e1c 0000 0000 0007 4960 2edc 002d 2f68 6f6d 652f 6f73 6173 322f 622f 7175 696e
0633300 7475 732f 7077 312e 312f 6c69 6272 6172 792f 7465 726d 5f61 746f 6d00 0030 2f68 6f6d 652f 6f73 6173 322f 622f 7175 696e
0633360 7475 732f 7077 312e 312f 6c69 6272 6172 792f 7465 726d 5f61 746f 612e 706c 0072 0000 002c 000b 22a4 b27c b66c 0000 00a7
0633440 7fff ffff 000a e760 0200 0db5 0200 2f35 0000 3a57 0000 024b 0000 315f 0015 6f70 6572 6174 6f72 735f 616e 645f 6e75 6d62
0633520 6572 7300 27f0 0014 000b 2c8c 4e1c 0000 0000 0007 54a8 228c 0000 002c 000a d3a4 b27c b66c 0000 0152 7fff ffff 000b 8d98
0633600 0200 0db5 0200 224d 0000 3a57 0000 39cf 0000 315f 2954 0014 0002 438a 2520 247c 000a de54 000c 2eb0 0000 002c 000a e82c
0633660 b27c b66c 0000 0153 7fff ffff 000b e150 0200 0db5 0200 24bd 0000 38c7 0000 39cf 0000 315f 0000 002c 000a e858 b27c b66c
0633740 0000 00ab 7fff ffff 000b 2394 0200 0db5 0200 2843 0000 39cf 0000 3a57 0000 315f 0000 0034 000a e9bc b27c b66c 0000 00ac
0634020 7fff ffff 000b 20cc 0200 0db5 0400 242d 0000 3a5f 0000 0013 0000 39cf 0000 21cf 0000 315f 0000 0034 000b 2098 b27c b66c
0634100 0000 00ad 7fff ffff 000b 2100 0200 0db5 0400 2421 0000 3a67 0000 0013 0000 39cf 0000 21cf 0000 315f 0000 0034 000b 20cc
0634160 b27c b66c 0000 00ae 7fff ffff 000b 2134 0200 0db5 0400 242d 0000 2e7f 0000 001b 0000 39cf 0000 21cf 0000 315f 0000 0034
0634240 000b 2100 b27c b66c 0000 00af 7fff ffff 000b 2168 0200 0db5 0400 242d 0000 3a6f 0000 001b 0000 39cf 0000 21cf 0000 315f
0634320 0000 0034 000b 2134 b27c b66c 0000 00b0 7fff ffff 000b 219c 0200 0db5 0400 242d 0000 3a77 0000 001b 0000 39cf 0000 21cf
0634400 0000 315f 0000 0034 000b 2168 b27c b66c 0000 00b1 7fff ffff 000b 23c0 0200 0db5 0400 242d 0000 3a7f 0000 001b 0000 39cf
0634460 0000 21cf 0000 315f 002a 2f68 6f6d 652f 6f73 6173 322f 622f 7175 696e 7475 732f 7077 312e 312f 6c69 6272 6172 792f 6261
0634540 7369 6373 003e 0009 002d 2f68 6f6d 652f 6f73 6173 322f 622f 7175 696e 7475 732f 7077 312e 312f 6c69 6272 6172 792f 6261
0634620 7369 6373 2e70 6c00 0035 2f68 6f6d 652f 6f73 6173 322f 622f 7175 696e 7475 732f 6765 6e65 7269 632f 7170 6c69 6232 2e35
0634700 2f6c 6962 7261 7279 2f62 6173 6963 7300 0038 2f68 6f6d 652f 6f73 6173 322f 622f 7175 696e 7475 732f 6765 6e65 7269 632f
0634760 7170 6c69 6232 2e35 2f6c 6962 7261 7279 2f62 6173 6963 732e 706c 0020 0000 002c 000a d240 b27c b66c 0000 00b3 7fff ffff
0635040 000b 1fa8 0200 0db5 0200 2f35 0000 3acf 0000 0253 0000 315f 2c78 0044 0002 438a 45b8 46ec 9300 9410 2e7c adec 2ba0 0018
0635120 0018 39a4 000d 7448 0018 aa50 2e98 3858 4368 2340 000b 475c 2c58 3858 4368 4538 6d0c 5370 242c 0000 000b 475c 27f0 0014
0635200 000b 47d0 4e1c 0000 0000 0007 4960 2edc 0000 002c 000b 2c60 b27c b66c 0000 00c4 7fff ffff 000a e7ec 0200 0db5 0200 224d
0635260 0000 3acf 0000 3a8f 0000 315f 000b 2538 0000 0038 b27c b66c 0000 0b3e 0000 0ba1 000b 253c 0200 0db5 0500 1cdd 0000 65c7
0635340 0000 0013 0000 3287 0057 a5e3 0000 034b 0000 315f 0011 5448 000e 7ac0 0000 002c 000b 206c b27c b66c 0000 00b7 7fff ffff
0635420 000a e678 0200 0db5 0200 284d 0000 3a8f 0000 3acf 0000 315f 0000 0034 000b 219c b27c b66c 0000 00b8 7fff ffff 000b 23f4
0635500 0200 0db5 0400 242d 0000 1d17 0000 001b 0000 3a8f 0000 21cf 0000 315f 0000 0034 000b 23c0 b27c b66c 0000 00b9 7fff ffff
0635560 000b 2428 0200 0db5 0400 242d 0000 3ad7 0000 0013 0000 3a8f 0000 21cf 0000 315f 0000 0034 000b 23f4 b27c b66c 0000 00ba
0635640 7fff ffff 000b 245c 0200 0db5 0400 242d 0000 3adf 0000 0013 0000 3a8f 0000 21cf 0000 315f 0000 0034 000b 2428 b27c b66c
0635720 0000 00bb 7fff ffff 000a e6a4 0200 0db5 0400 242d 0000 3ae7 0000 0013 0000 3a8f 0000 21cf 0000 315f 2c78 00ac 0002 438a
0636000 45e8 0028 4728 001c 4740 382c 001c 32d4 24d0 0000 000b b0f4 002c 32f0 0020 247c 0008 bb9c 002c 3c9c 0000 001c 0008 e19c
0636060 002c 2e7c ae74 0024 2ba0 002c 0020 3c9c 0000 0028 0008 b67c 0028 aa88 0024 2e98 32b8 4c70 0000 000b 2c88 000e 2c58 32b8
0636140 4e1c 0000 0000 0003 40b4 0020 0008 e19c 0020 3c9c 0000 001c 0008 b95c 001c 332c 3c48 0000 000b b114 001c 40a0 000b b134
0636220 0018 3d0c 4e1c 0000 0000 000b 3d00 4a7c 000c 723c 000b 269c 0000 0038 b27c b66c 0000 0b3f 0000 0ba2 000b 27e0 0200 0db5
0636300 0500 1cdd 0000 65cf 0000 0013 0000 3287 0058 4d83 0000 034b 0000 315f 2c78 00a8 0002 438a 45e8 0028 46d8 3380 001c 32d4
0636360 24d0 0000 000b b0f4 002c 32f0 0020 247c 0008 bb9c 002c 3c9c 0000 001c 0008 e19c 002c 2e7c ae74 0024 2ba0 002c 0020 3c9c
0636440 0000 0028 0008 b67c 0028 aa88 0024 2e98 32b8 4c70 0000 000b 2c88 000e 2c58 32b8 4e1c 0000 0000 0003 40b4 0020 0008 e19c
0636520 0020 411c 0000 001c 0008 b95c 001c 332c 3c48 0000 000b b114 001c 40a0 000b b134 0018 3d0c 4e1c 0000 0000 000b 3d00 4a7c
0636600 000c 723c 0011 1348 0200 65d7 0000 3287 0000 0008 000b 286c 000b 286c 0001 0069 0000 0000 0013 6f70 6572 6174 6f72 5f61
0636660 6e64 5f6e 756d 6265 7200 315f 2c78 004a 0002 438a 45e8 001c 46d8 3364 32b8 247c 000b b0f4 0020 382c 001c 3aa0 0008 ec7c
0636740 001c 40a0 0008 b95c 0018 332c 3bf4 0000 000b b114 0018 408c 000b b134 0014 3d00 4a7c 000c 723c 2062 000b 27dc 0000 00dc
0637020 4e1c 0000 0000 4117 5d7c 0000 0400 4d17 64a8 6160 5e54 0000 0100 0ab7 4b8c 0000 0000 253f 5de8 0000 0100 0ab7 4b8c 0000
0637100 0000 229f 5d7c 0000 0100 0ad7 4b8c 0000 0000 253f 56f8 671c 5370 5aec 0100 0ad7 4b8c 0000 0000 253f 228c b32c 000b 27dc
0637160 0000 0078 4e1c 0000 0000 4d27 5d7c 0000 0500 4d27 67ec 0018 64a8 6160 5c9c 0018 0100 0ab7 4b8c 0000 0000 253f 5e54 0000
0637240 0100 0ab7 4b8c 0000 0000 229f 5de8 0000 0100 0ad7 4b8c 0000 0000 253f 5d7c 0000 0100 0ad7 4b8c 0000 0000 229f 56f8 671c
0637320 5370 5aec 0100 0ad7 4b8c 0000 0000 253f 228c 3a97 b464 5308 000b 3060 000f 5d54 2c78 0058 0002 438a 45dc 4700 4790 001c
0637400 aa50 aab4 0000 a1d0 000e 37c4 001c 4c70 0000 0007 723c aa50 aab4 0000 a484 37c4 001c 56f8 671c 6a00 33a0 3818 24d0 0000
0637460 000b b288 0018 aa50 aaf0 ffff ac4c 3858 3cf4 234c 000b b248 000b 28a8 0000 0094 b27c b66c 0000 0b40 0000 0ba3 000b 4a1c
0637540 0200 0db5 0500 1cdd 0000 65d7 0000 0013 0000 3287 0059 3123 0000 034b 0000 315f 000b 28a8 0000 005c 5d10 0000 0100 3037
0637620 4b8c 0000 0000 3ba7 5758 4af8 0000 3b47 55f0 4af8 0000 3baf 55f0 4af8 0000 3b67 55f0 4af8 0000 3b9f 55f0 4af8 0000 3b8f
0637700 55f0 4af8 0000 3b57 55f0 4af8 0000 3b87 55f0 4af8 0000 3b7f 5370 228c 2cac 2c90 0002 438a 2ca0 b66c 0000 0000 0000 0001
0637760 000b 1fe4 000b 2c8c 000b 2c96 0011 3544 27f0 0014 000b 4dd0 4e1c 0000 0000 0007 54a8 228c 000b 2cf0 0000 02b8 4e1c 0000
0640040 0000 3b47 5d7c 0000 0300 3b47 6784 6160 5de8 0000 0100 0ab7 4b8c 0000 0000 253f 5d7c 0000 0100 0ab7 4b8c 0000 0000 253f
0640120 56f8 671c 5370 5aec 0100 0ad7 5a18 0000 0100 1cb7 4b8c 0000 0000 1e97 228c 2020 000b 2938 0000 0034 4e1c 0000 0000 3baf
```

```
0640200 5d7c 0000 0100 3baf 5a18 0000 0100 0ab7 5a18 0000 0100 1cb7 4b8c 0000 0000 1e97 228c 656e 000b 299c 0000 0064 4e1c 0000
0640260 0000 3b67 5d7c 0000 0300 3b67 6784 6150 5de8 0000 0100 0ab7 4b8c 0000 0000 253f 5d7c 0000 0100 0ab7 5a18 0000 0100 1cb7
0640340 4b8c 0000 0000 1e97 56f8 671c 5370 5aec 0100 0ad7 5a18 0000 0100 1cb7 4b8c 0000 0000 1e97 228c 6e20 000b 2a00 0000 0064
0640420 4e1c 0000 0000 3b9f 5d7c 0000 0300 3b9f 6784 6160 5de8 0000 0100 0ad7 4b8c 0000 0000 253f 5d7c 0000 0100 0ab7 5a18 0000
0640500 0100 1cb7 4b8c 0000 0000 1e97 56f8 671c 5370 5aec 0100 0ad7 5a18 0000 0100 1cb7 4b8c 0000 0000 1e97 228c 7465 000b 2a64
0640560 0000 0064 4e1c 0000 0000 3b8f 5d7c 0000 0300 3b8f 6784 6160 5de8 0000 0100 0ab7 5a18 0000 0100 1cb7 4b8c 0000 0000 3bb7
0640640 5d7c 0000 0100 0ad7 5a18 0000 0100 1cb7 4b8c 0000 0000 1e97 56f8 671c 5370 5aec 0100 0ad7 4b8c 0000 0000 253f 228c 6169
0640720 000b 2ad0 0000 006c 4e1c 0000 0000 3b57 5d7c 0000 0400 3b57 64a8 6160 5e54 0000 0100 0ab7 5a18 0000 0100 1cb7 4b8c 0000
0641000 0000 1e97 5de8 0000 0100 0ab7 4b8c 0000 0000 253f 5d7c 0000 0100 0ad7 4b8c 0000 0000 253f 56f8 671c 5370 5aec 0100 0ad7
0641060 4b8c 0000 0000 253f 228c 212c 000b 2b2c 0000 005c 4e1c 0000 0000 3b87 5d7c 0000 0300 3b87 6784 6160 5de8 0000 0100 0ad7
0641140 5a18 0000 0100 1cb7 4b8c 0000 0000 3bb7 5d7c 0000 0100 0ad7 4b8c 0000 0000 253f 56f8 671c 5370 5aec 0100 0ad7 4b8c 0000
0641220 0000 253f 228c 2076 000b 2cf0 0000 0034 4e1c 0000 0000 3b7f 5d7c 0000 0100 3b7f 5a18 0000 0100 0ab7 5a18 0000 0100 1cb7
0641300 4b8c 0000 0000 3bb7 228c 0a0a 0037 2f68 6f6d 652f 6f73 6173 322f 622f 7175 696e 7475 732f 6765 6e65 7269 632f 7170 6c69
0641360 6232 2e35 2f6c 6962 7261 7279 2f73 756e 342d 342e 3000 726e 0041 2f68 6f6d 652f 6f73 6173 322f 622f 7175 696e 7475 732f
0641440 6765 6e65 7269 632f 7170 6c69 6232 2e35 2f6c 6962 7261 7279 2f73 756e 342d 342e 302f 6368 6172 7369 6f2e 6f00 0035 2f68
0641520 6f6d 652f 6f73 6173 322f 622f 7175 696e 7475 732f 6765 6e65 7269 632f 7170 6c69 6232 2e35 2f6c 6962 7261 7279 2f73 756e
0641600 342d 3400 003f 2f68 6f6d 652f 6f73 6173 322f 622f 7175 696e 7475 732f 6765 6e65 7269 632f 7170 6c69 6232 2e35 2f6c 6962
0641660 7261 7279 2f73 756e 342d 342f 6368 6172 7369 6f2e 6f00 6865 0000 002c 000b 8d98 b27c b66c 0000 00fc 7fff ffff 000b 2328
0641740 0200 0db5 0200 224d 0000 3b17 0000 3a97 0000 315f 0002 2f3d 000b 88b1 2954 0024 0002 438a 56f8 671c 682c 5758 6750 6a00
0642020 24d0 0000 000b 4608 0014 2330 000b 2624 0012 5350 0010 1834 0030 2f68 6f6d 652f 6f73 6173 322f 622f 7175 696e 7475 732f
0642100 6269 6e32 2e35 2f73 756e 342d 342e 302f 7072 6f77 696e 646f 7773 0061 000b 3824 0000 02b0 000b 09d8 000b 1100 000b 11c0
0642160 000b 063c 000b 0a18 000b 1140 000b 1200 000b 0918 000b 106c 000b 1180 000b 1240 000b 10ac 0000 0000 0000 0000 0000 0000
0642240 0000 0000 0000 0000 0000 0000 0000 0000 0000 0000 0000 0000 0000 0000 0000 0000 0000 0000 0000 0000 0000 0000 0000 0000
0642320 0000 0000 0000 0000 000b 12d4 000e 6ae4 0000 0000 000b 26a4 0000 0000 000e 86cd 000b 2e58 000b 0958 000b 2df8 000b 2ed0
0642400 000b 2f30 0000 0000 0000 0000 0000 0000 0000 0000 0000 0000 000b 1280 000b 1328 0000 0000 0000 000e 69d0 000e 6a50
0642460 000e 6a90 000e 5d00 000b 0338 000b 0378 0000 0000 000e 21e8 000b 06b0 000b 06f0 000b 0730 000b 0784 000b 07c4 000b 2e50
0642540 0000 0060 4e1c 0000 0000 4d3f 5d7c 0000 0400 4d3f 64a8 6160 5e54 0000 0100 0ab7 4b8c 0000 0000 253f 5de8 0000 0100 0ab7
0642620 4b8c 0000 0000 229f 5d7c 0000 0100 0ad7 4b8c 0000 0000 229f 5d10 0000 0100 0ad7 4b8c 0000 0000 229f 228c 203d 000b 2ec8
0642700 0000 0078 4e1c 0000 0000 4d2f 5d7c 0000 0500 4d2f 67ec 0018 64a8 6160 5c9c 0018 0100 0ab7 4b8c 0000 0000 253f 5e54 0000
0642760 0100 0ad7 4b8c 0000 0000 229f 5de8 0000 0100 0ab7 4b8c 0000 0000 229f 5d7c 0000 0100 0ab7 4b8c 0000 0000 229f 56f8 671c
0643040 5370 5aec 0100 0ad7 4b8c 0000 0000 253f 228c 726e 000b 2f28 0000 0060 4e1c 0000 0000 4d47 5d7c 0000 0400 4d47 64a8 6160
0643120 5e54 0000 0100 0ab7 4b8c 0000 0000 229f 5de8 0000 0100 0ad7 4b8c 0000 0000 253f 5d7c 0000 0100 0ad7 4b8c 0000 0000 229f
0643200 5d10 0000 0100 0ad7 4b8c 0000 0000 253f 228c 7465 000b 3824 0000 0078 4e1c 0000 0000 4d4f 5d7c 0000 0500 4d4f 67ec 0018
0643260 64a8 6160 5c9c 0018 0100 0ad7 4b8c 0000 0000 229f 5e54 0000 0100 0ab7 4b8c 0000 0000 253f 5de8 0000 0100 0ab7 4b8c 0000
0643340 0000 229f 5d7c 0000 0100 0ab7 4b8c 0000 0000 253f 56f8 671c 5370 5aec 0100 0ad7 4b8c 0000 0000 253f 228c 4578 003e 2f68
0643420 6f6d 652f 6f73 6173 322f 622f 7175 696e 7475 732f 6765 6e65 7269 632f 7170 6c69 6232 2e35 2f6c 6962 7261 7279 2f73 756e
0643500 342d 342e 302f 6461 7468 2e6f 000a 096f 003c 2f68 6f6d 652f 6f73 6173 322f 622f 7175 696e 7475 732f 6765 6e65 7269 632f
0643560 7170 6c69 6232 2e35 2f6c 6962 7261 7279 2f73 756e 342d 342f 6d61 7468 2e6f 0009 0000 002c 000c f83c b27c b66c 0000 054b
0643640 7fff ffff 000a e5b4 0200 0db5 0200 224d 0000 4b97 0000 4b77 0000 315f 000e 8108 000a 34d8 0000 002c 000a e5e8 b27c b66c
0643720 0000 054c 7fff ffff 000c f2d4 0200 0db5 0200 24bd 0000 3287 0000 4b77 0000 315f 0000 002c 000e 87dc b27c b66c 0000 0525
0644000 7fff ffff 000b 30b4 0200 0db5 0200 22ed 0000 4bb7 0078 44c3 0000 315f 0000 002c 000b 3088 b27c b66c 0000 0526 7fff ffff
0644060 000b 30e0 0200 0db5 0200 22ed 0000 4b17 0074 a183 0000 315f 0000 002c 000b 30b4 b27c b66c 0000 0527 7fff ffff 000b 310c
0644140 0200 0db5 0200 22ed 0000 4bbf 0076 1a03 0000 315f 0000 002c 000b 30e0 b27c b66c 0000 0528 7fff ffff 000b 3138 0200 0db5
0644220 0200 22ed 0000 4bc7 0078 1e03 0000 315f 0000 002c 000b 310c b27c b66c 0000 0529 7fff ffff 000b 3164 0200 0db5 0200 22ed
0644300 0000 4bdf 0075 5143 0000 315f 0000 002c 000b 3138 b27c b66c 0000 052a 7fff ffff 000b 3190 0200 0db5 0200 22ed 0000 4be7
0644360 0075 83a3 0000 315f 0000 002c 000b 3164 b27c b66c 0000 052b 7fff ffff 000b 31bc 0200 0db5 0200 22ed 0000 4bef 0075 bd43
0644440 0000 315f 0000 002c 000b 3190 b27c b66c 0000 052c 7fff ffff 000b 31e8 0200 0db5 0200 22ed 0000 4bf7 0075 62a3 0000 315f
0644520 0000 002c 000b 31bc b27c b66c 0000 052d 7fff ffff 000b 3214 0200 0db5 0200 22ed 0000 4bff 0075 9aa3 0000 315f 0000 002c
0644600 000b 31e8 b27c b66c 0000 052e 7fff ffff 000b 3240 0200 0db5 0200 22ed 0000 4c07 0075 d7e3 0000 315f 0000 002c 000b 3214
0644660 b27c b66c 0000 052f 7fff ffff 000b 326c 0200 0db5 0200 22ed 0000 4c0f 0077 2b43 0000 315f 0000 002c 000b 3240 b27c b66c
0644740 0000 0530 7fff ffff 000b 3298 0200 0db5 0200 22ed 0000 4c2f 0077 2b83 0000 315f 0000 002c 000b 326c b27c b66c 0000 0531
0645020 7fff ffff 000b 32c4 0200 0db5 0200 22ed 0000 4c4f 0077 2bc3 0000 315f 0000 002c 000b 3298 b27c b66c 0000 0532 7fff ffff
0645100 000e 875c 0200 0db5 0200 22ed 0000 4c17 0075 4003 0000 315f 0000 002c 0014 8e84 b27c b66c 0000 0e68 7fff ffff 000b 331c
0645160 0200 0db5 0200 22ed 0000 6fb7 00a4 9c23 0000 315f 0000 002c 000b 32f0 b27c b66c 0000 0e69 7fff ffff 000b 3348 0200 0db5
0645240 0200 22ed 0000 6fa7 00a4 9b43 0000 315f 0000 002c 000b 331c b27c b66c 0000 0e6a 7fff ffff 000b 3374 0200 0db5 0200 22ed
```

```
0645320 0000 7077 00a4 c523 0000 315f 0000 002c 000b 3348 b27c b66c 0000 0e6b 7fff ffff 000b 33a0 0200 0db5 0200 22ed 0000 7027
0645400 00a4 c883 0000 315f 0000 002c 000b 3374 b27c b66c c000 0e6c 7fff ffff 0013 c284 0200 0db5 0200 22ed 0000 6fbf 00a4 a4e3
0645460 0000 315f 2c78 0024 0002 438a 7ae4 0000 7fe8 813c 8130 7fc4 7ebc 0000 0014 9c64 0010 8924 0018 228c 0000 002c c00e 8788
0645540 b27c b66c 0000 0535 7fff ffff 000b 341c 0200 0db5 0200 22ed 0000 4c6f 0076 5e23 0000 315f 0000 002c 000b 33f0 b27c b66c
0645620 0000 0536 7fff ffff 000b 3448 0200 0db5 0200 22ed 0000 4c1f 0076 ca03 0000 315f 0000 002c 000b 341c b27c b66c 0000 0537
0645700 7fff ffff 000b 3474 0200 0db5 0200 22ed 0000 4c3f 0076 b883 0000 315f 0000 002c 000b 3448 b27c b66c 0000 0538 7fff ffff
0645760 000b 34a0 0200 0db5 0200 22ed 0000 4c5f 0076 4943 0000 315f 0000 002c 000b 3474 b27c b66c 0000 0539 7fff ffff 000b 34cc
0646040 0200 0db5 0200 22ed 0000 4c27 0074 46e3 0000 315f 0000 002c 000b 34a0 b27c b66c 0000 053a 7fff ffff 000b 34f8 0200 0db5
0646120 0200 22ed 0000 4c47 0074 5803 0000 315f 0000 002c 000b 34cc b27c b66c 0000 053b 7fff ffff 000b 3524 0200 0db5 0200 22ed
0646200 0000 4c67 0074 6003 0000 315f 0000 002c 000b 34f8 b27c b66c 0000 053c 7fff ffff 000b 3550 0200 0db5 0200 22ed 0000 4d07
0646260 0074 4003 0000 315f 0000 002c 000b 3524 b27c b66c 0000 053d 7fff ffff 000b 357c 0200 0db5 0200 22ed 0000 4d7f 0074 b743
0646340 0000 315f 0000 002c 000b 3550 b27c b66c 0000 053e 7fff ffff 000b 35a8 0200 0db5 0200 22ed 0000 4cff 0077 fb43 0000 315f
0646420 0000 002c 000b 357c b27c b66c 0000 053f 7fff ffff 000b 35d4 0200 0db5 0200 22ed 0000 4d17 0074 90a3 0000 315f 0000 002c
0646500 000b 35a8 b27c b66c 0000 0540 7fff ffff 000b 3600 0200 0db5 0200 22ed 0000 4d27 0074 98c3 0000 315f 0000 002c 000b 35d4
0646560 b27c b66c 0000 0541 7fff ffff 000b 362c 0200 0db5 0200 22ed 0000 4d37 0074 6ec3 0000 315f 0000 002c 000b 3600 b27c b66c
0646640 0000 0542 7fff ffff 000b 3658 0200 0db5 0200 22ed 0000 4d3f 0074 74c3 0000 315f 0000 002c 000b 362c b27c b66c 0000 0543
0646720 7fff ffff 000b 3684 0200 0db5 0200 22ed 0000 412f 0074 7c83 0000 315f 0000 002c 000b 3658 b27c b66c 0000 0544 7fff ffff
0647000 000b 36b0 0200 0db5 0200 22ed 0000 4d47 0074 a283 0000 315f 0000 002c 000b 3684 b27c b66c 0000 0545 7fff ffff 000b 36dc
0647060 0200 0db5 0200 22ed 0000 4d4f 0074 a5a3 0000 315f 0000 002c 000b 36b0 b27c b66c 0000 0546 7fff ffff 0014 8ca0 0200 0db5
0647140 0200 22ed 0000 4d87 0074 6d03 0000 315f 0000 0040 000b 0034 b27c b66c 0000 0547 7fff ffff 0013 c448 0200 0db5 0300 22e5
0647220 0000 0001 0000 4d9f 0000 0007 0000 0001 0000 4d8f 0000 0007 0000 4b77 0000 315f 2cac 5a90 0002 438a 2ca0 42dd 0000 0000
0647300 0000 0001 000b 1f28 000b 4690 0011 3978 0011 3c9c 28c4 004c 000b 4690 56f8 687c 0020 69b0 4714 4768 3af4 0020 000b 5a9c
0647360 0024 3380 001c 3c9c 0000 0020 000b 5abc 0020 33bc 3e70 001c 3c48 0000 000c 4118 0018 2ecc 386c 3d30 2420 0000 000b 3ec0
0647440 2b24 397c 0002 438a 000b 469a 0014 3fd0 0000 0060 000a 2cec b27c b66c 0000 13a4 7fff ffff 000b 397c 0200 0db5 0500 6945
0647520 0200 61bd 0200 0ad5 0000 2ad7 0000 0043 0100 61bd 0200 0ad5 0000 6317 0000 0033 0100 61bd 0200 0ad5 0000 6317 0000 001b
0647600 0000 8b07 0000 001b 0000 001b 0000 315f 000b 38a0 0000 0048 0000 034b 0000 315f 000b 38a0 0000 0038 b27c b66c 0000 0b26
0647660 0000 0b89 000b 38a4 0200 0db5 0500 1cdd 0000 5fcf 0000 000b 0000 3287 0090 09a3 0000 034b 0000 315f 2c78 0034 0002 438a
0647740 45b8 3348 3b4c 0000 0012 784c 0018 332c 40f4 0000 0012 786c 0014 3d30 3b4c 0000 0012 788c 0010 2340 0012 0c40 000b 390c
0650020 0000 0038 b27c b66c 0000 0b27 0000 0b8a 000b 3910 0200 0db5 0500 1cdd 0000 5fc7 0000 000b 0000 3287 0090 08a3 0000 034b
0650100 0000 315f 2c78 0034 0002 438a 45b8 3348 3b4c 0000 0012 017c 0018 332c 40f4 0000 0012 78d8 0014 3d30 3b4c 0000 0012 78f8
0650160 0010 2340 0012 0c40 000b 3a24 0000 0038 b27c b66c 0000 0b28 0000 0b8b 000b 397c 0200 0db5 0500 1cdd 0000 5fe7 0000 0013
0650240 0000 3287 0090 0ce3 0000 034b 0000 315f 2c78 0034 0002 438a 3690 4408 0100 5ff7 4b8c 0000 0000 5307 447c 0000 0400 630f
0650320 6c08 6b88 6bf4 4af8 0000 5307 239c 0000 0012 0c40 0000 0060 000b 37c8 b27c b66c 0000 13a5 7fff ffff 000b 3afc 0200 0db5
0650400 0500 6945 0200 61bd 0200 0ad5 0000 2ad7 0000 003b 0100 61bd 0200 0ad5 0000 6317 0000 0033 0100 61bd 0200 0ad5 0000 6317
0650460 0000 001b 0000 8b07 0000 0013 0000 0013 0000 315f 000a d198 0000 0010 0013 14c4 0000 0000 0037 7e6e 2a2a 2a20 5761 726e
0650540 696e 673a 2056 6172 6961 626c 6520 7e61 2068 6173 2061 6c72 6561 6479 2062 6565 6e20 6465 636c 6172 6564 2e7e 6e00 6669
0650620 000b 3c1c 0000 0038 b27c b66c 0000 0b2b 0000 0b8e 000b 3afc 0200 0db5 0500 1cdd 0000 6017 0000 002b 0000 3287 0093 c9a3
0650700 0000 034b 0000 315f 2c78 009c 0002 438a 45e8 0024 46ec 4790 001c 47f8 0020 4864 0018 3280 24d0 0000 0012 7954 0028 382c
0650760 0024 39a4 0012 0acc 0024 382c 0020 39a4 0012 42d4 0020 382c 001c 39a4 0012 4354 001c 3818 3b4c 0000 0012 0b0c 0018 37f0
0651040 3b4c 0000 0012 0aec 0018 2e7c adec 2ba0 0018 0026 3b4c 0000 0012 73cc 0018 aa50 2e98 4550 6d50 5370 4300 0000 0000 656f
0651120 0012 7974 0010 2eb0 2c58 3cf4 242c 0000 0012 7994 0000 0060 000b 397c b27c b66c 0000 13a6 7fff ffff 000b 3b5c 0200 0db5
0651200 0500 6945 0200 61bd 0200 0ad5 0000 2ad7 0000 0033 0100 61bd 0200 0ad5 0000 6317 0000 0033 0100 61bd 0200 0ad5 0000 6317
0651260 0000 001b 0000 8b07 0000 0013 0000 0013 0000 315f 0000 0060 000b 3afc b27c b66c 0000 13a7 7fff ffff 000b 6b24 0200 0db5
0651340 0500 6945 0200 61bd 0200 0ad5 0000 2ad7 0000 002b 0100 61bd 0200 0ad5 0000 6317 0000 0033 0100 61bd 0200 0ad5 0000 6317
0651420 0000 001b 0000 8b07 0000 001b 0000 001b 0000 315f 0017 efc0 0000 3d67 0000 3287 0000 0000 001a 40e0 001a 40e0 0001 0045
0651500 0000 0000 2954 0024 0002 438a 56f8 671c 682c 5758 6750 6a00 24d0 0000 000b 3c08 0014 2330 0012 79cc 0010 e84c 0200 657f
0651560 0000 3287 0000 0008 000b 3c50 000b 3c50 0001 0069 0000 0000 000b 3ca8 0000 0038 b27c b66c 0000 0b30 0000 0b93 000b 3cac
0651640 0200 0db5 0500 1cdd 0000 657f 0000 0013 0000 3287 0059 e043 0000 034b 0000 315f 2c78 0018 0002 438a 45b8 39a4 0012 0fe4
0651720 0010 2340 0012 73cc 0016 7072 6f63 626f 6469 6573 5f61 6e64 5f6e 756d 6265 7273 0028 5831 0010 e8dc 0200 6587 0000 3287
0652000 0000 0008 000b 3cf0 000b 3cf0 0001 0069 0000 0000 000b 3d74 0000 0038 b27c b66c 0000 0b31 0000 0b94 000b 3d78 0200 0db5
0652060 0500 1cdd 0000 6587 0000 0013 0000 3287 0059 e4a3 0000 034b 0000 315f 27f0 0014 000b 3d2c 4e1c 0000 0000 0007 54a8 228c
0652140 2cac 2e40 0002 438a 2ca0 2c20 0000 0000 0000 0001 000b 3cdc 000b 3d2c 000b 3d36 000b 404c 0013 7072 6f63 626f 6479 5f61
0652220 6e64 5f6e 756d 6265 7200 4675 2954 0024 0002 438a 56f8 671c 682c 5758 6750 6a00 24d0 0000 000b 3d60 0014 2330 000b 3c94
0652300 0010 e9f4 0200 658f 0000 3287 0000 0008 000b 3da8 000b 3da8 0001 0069 0000 0000 000b 3e00 0000 0038 b27c b66c 0000 0b32
0652360 0000 0b95 000b 3e04 0200 0db5 0500 1cdd 0000 658f 0000 0013 0000 3287 0059 eb03 0000 034b 0000 315f 2c78 0018 0002 438a
```

1401

1402

```
0652440  45b8 39a4 0012 3a80 0010 2340 0012 73cc 0018 7072 6f63 626f 6479 5f6e 756d 6265 7273 5f61 6e64 5f69 6473 0020 0010 ea9c
0652520  0200 6597 0000 3287 0000 0008 000b 3e34 000b 3e34 0001 0069 0000 0000 000b 3e7c 0000 0038 b27c b66c 0000 0b33 0000 0b96
0652600  000b 3e80 0200 0db5 0500 1cdd 0000 6597 0000 0013 0000 3287 0059 ef63 0000 034b 0000 315f 2c78 0024 0002 438a 2520 46ec
0652660  35c8 3280 24d0 0000 000b 3c94 0014 37f0 3cf4 234c 0012 79cc 0010 f010 0200 659f 0000 3287 0000 0008 000b 1ee4 000b 1ee4
0652740  0001 0069 0000 0000 000b 4718 0000 0038 b27c b66c 0000 0b34 0000 0b97 000b 0564 0200 0db5 0500 1cdd 0000 659f 0000 0013
0653020  0000 3287 0059 f343 0000 034b 0000 315f ffff ffff 0300 65a7 0000 3287 0000 000c 000b 3740 000b 3740 0001 0069 0000 0000
0653100  000e 6f70 5f69 645f 6c69 7374 5f61 7578 0029 2c0a 000a 4058 0000 0000 0000 38c7 b464 e54c 000a aaa4 000b 45c4 000b 3eec
0653160  000a 25e0 000d 636f 6e74 6169 6e73 5f74 6572 6d00 000c 636f 6e74 6169 6e73 5f76 6172 00bf 000c 6672 6565 5f6f 665f 7465
0653240  726d 0097 000b 6672 6565 5f6f 665f 7661 7200 0a7f 0013 6f63 6375 7272 656e 6365 735f 6f66 5f74 6572 6d00 2177 0012 6f63
0653320  6375 7272 656e 6365 735f 6f66 5f76 6172 000b 3f70 0000 39ef b328 e760 000a e764 0000 0000 0000 2e7f b328 af5d 000b 2104
0653400  0000 0000 0000 39ef b328 0000 000a e7f0 0000 0000 0000 39c7 b328 3fac 000a e85c 0000 0000 ffff ffff 0200 39f7 0000 39c7
0653460  0000 0008 000b 41f0 000b 41f0 0001 0048 0000 0000 0000 39f7 b328 3fd8 000a e888 0000 0000 ffff ffff 0200 39ff 0000 39c7
0653540  0000 0008 000b 43c0 000b 43c0 0001 0048 0000 0000 0000 39ff b328 4001 000a e8bc 0000 0000 0008 d20c 0200 3a07 0000 39c7
0653620  0000 0008 000b 4238 000b 4248 0001 0048 0000 0000 0000 3a07 b328 1d8f 000a e8f0 0000 0000 0004 6572 7232 0000 000b 3ce8
0653700  0014 40d0 ffff ffff 0200 3a0f 0000 39c7 0000 0008 000b 43e8 000b 4424 0001 0048 0000 0000 0000 3a0f b328 4081 000a e924
0653760  0000 0000 ffff ffff 0300 3a17 0000 39c7 0000 000c 000a eb60 000a eb60 0001 0048 0000 0000 0000 3a17 b328 38c7 000a e958
0654040  0000 0000 ffff ffff 0300 3a1f 0000 39c7 0000 000c 000a edf0 000a edf0 0001 0048 0000 0000 0000 3a1f b328 2f7f 000a e98c
0654120  0000 0000 0008 d24c 0200 3a27 0000 39c7 0000 0008 000b 4530 000b 453c 0001 0048 0000 0000 0000 3a27 b328 1e7f 000a e9c0
0654200  0000 0000 0011 b3f0 0010 9590 0011 d060 0000 0000 001d 2240 2823 2938 382f 3031 2f31 3220 6f63 6375 7273 2e70 6c09 3232
0654260  2e31 2200 0008 dcac 0100 2def 0000 39c7 0000 0004 000b 41b4 000b 41b4 0001 0048 0000 0000 0000 3a67 b328 4171 000b 20d0
0654340  0000 0000 0000 0028 000a a4fc b27c b66c 0000 0082 7fff ffff 000b 8978 0200 0db5 0100 32b5 0000 39c7 0000 315f 0000 39c7
0654420  b328 41ae 000b 4180 0000 0000 000b 419c 000a 1eb4 2cac 2247 0002 438a 2ca0 38df 0000 0000 0000 0001 000a e4dc 000a e4dc
0654500  0002 438a 000a e574 000c 3a5f b328 41cc 000b 209c 0000 0000 0014 8938 000a f284 2c78 0028 0002 438a 2520 2e7c ad64 2ba0
0654560  0010 0012 24d0 0000 000b 4024 0010 aa18 2e98 c5a8 2c58 723c 0000 39cf b328 09cf 000b 2070 0000 0000 0000 3a57 b328 4164
0654640  000b 1fac 0000 0000 27f0 000e 000b 4248 48f8 3050 c5a8 424a 2954 0020 0002 438a 45d0 46ec 33a0 320c 3788 6f34 386c 37f0
0654720  3cf4 234c 000b 4278 000b 4014 0300 3a07 0000 39c7 0000 000c 000b 42a8 000a eaf4 0001 0048 0000 0000 b464 e524 000a eb34
0655000  0000 0000 2938 0012 000a eaf4 4e1c 0000 0000 0003 2edc 42aa 27f0 035b 000a eaf4 2ca0 017b 0000 0000 0000 0001 000b 4294
0655060  000a eaf4 0002 438a 000a e5a8 000a 6765 745f 6e75 6d62 6572 000b 4460 0013 35f4 0000 0000 000b 4084 0400 3a17 0000 39c7
0655140  0000 0010 000b 4310 000a ebc8 0001 0048 0000 0000 0009 6261 7369 6373 2e70 6c00 27f0 0016 000a ebc8 48f8 3050 a890 aaf0
0655220  0001 aefc 7220 432a 000b 42e4 0500 3a17 0000 39c7 0000 0014 000b 436c 000a ec30 0001 0048 0000 0000 b464 428c 000a ea90
0655300  0000 0000 2938 0016 000a ec30 4e1c 0000 0000 0003 4a48 0018 2edc 0263 27f0 4372 000a ec30 2ca0 437a 0000 0000 0000 0001
0655360  000b 4354 000a ec30 0002 438a 000a aac4 0000 3a57 b328 0000 000b 2004 0000 0000 000a a924 0200 3dff 0000 3287 0000 0008
0655440  000a f4d8 000a f4d8 0001 004d 0000 0000 2c78 0028 c002 438a 2520 2e7c ad64 2ba0 0010 0012 24d0 0000 000b 4064 0010 aa18
0655520  2e98 c5a8 2c58 723c 27f0 001c 000a ecf0 3640 2520 35c8 3588 8d94 aab4 0000 a168 2ecc c5a8 000b 4054 0300 3a0f 0000 39c7
0655600  0000 000c 000b 443c 000a ed80 0001 0046 0000 0000 2954 000a 0002 438a 228c 4432 0009 6d65 6d62 6572 6368 6b00 27f0 0007
0655660  000a ed80 2ca0 444a 0000 0000 0000 0001 000a ed54 000a ed80 0002 438a 000a a5c4 000c 6174 6f6d 5f74 6f5f 7465 726d 0000
0655740  000b 40b4 0400 3a1f 0000 39c7 0000 0010 000b 449c 000b 44e0 0001 0048 0000 0000 0007 6368 6172 7369 6f00 44ec 27f0 0022
0656020  000a ee58 2520 4754 47a8 8d94 aab4 0000 a168 2ecc aa34 aaf0 0001 af34 723c 44c2 000b 4470 0500 3a1f 0000 39c7 0000 0014
0656100  000b 44f8 000a eefc 0001 0048 0000 0000 2954 000c 0002 438a 49c8 228c 0007 5172 656e 616d 6500 c92c 27f0 0263 000a eefc
0656160  2ca0 017b 0000 0700 0000 0001 000a eec8 0001 eefc 0002 438a 000b 451c 000a eed4 000c 7465 726d 5f74 6f5f 6174 6f6d 0000
0656240  27f0 000c 000b 453c 48f8 228c 2754 0024 0002 438a 45d0 46ec 9314 9410 33a0 320c 3788 6f34 386c 37f0 3cf4 234c 000b 4570
0656320  000b 40e4 0300 3a27 0000 39c7 0000 000c 000b 458c 000b 45a4 0001 0048 0000 0000 0008 7465 726d 6174 6f6d 0000 27f0 0018
0656400  000b 45a4 2520 4740 33bc 6e74 3d30 2340 000b 40f4 2954 0020 0002 438a a858 aab4 0001 a484 a858 aaf0 ffff ac08 239c 0000
0656460  000b 4570 b464 e524 000a e830 000b de10 2c78 0012 0002 438a 4e1c 0000 0000 3aef 228c 0000 0009 6f62 6a65 6374 6966 7900
0656540  000a f325 0000 0000 0011 139c 0200 65df 0000 3287 0000 0008 000b 4618 000b 4618 0001 0069 0000 0000 2c78 0018 0002 438a
0656620  45b8 39a4 0012 0938 0010 2340 0012 73cc 2b24 09c4 0002 438a 000b 5fe2 0009 6e6f 6e6d 656d 6265 7200 0006 6d65 6d62 6572
0656700  000b 4654 0003 6672 6f6d 5f6e 746f 0060 0006 6261 7369 6373 000b 466c 0008 6765 745f 6174 6f6d 0078 0008 6765 745f 7465
0656760  726d 0084 0009 6f63 6375 7273 2e70 6c00 2954 0084 0002 438a 56f8 671c 687c 001c 46ec 4768 4550 4af8 0000 5ee7 5370 4568
0657040  4b8c 0000 0000 533f 6bb4 4550 4b8c 0000 0000 52c7 6bf4 4568 4b8c 0000 0000 5347 6bb4 4550 4b8c 0000 0000 5237 6bf4 4568
0657120  4b8c 0000 0000 52b7 6bb4 3364 24d0 0000 0012 1110 0020 33a0 382c 001c 4108 0000 000c 4118 0018 2ecc 386c 37f0 3cf4 234c
0657200  000b 3ec0 000b 4320 0000 0038 b27c b66c 0000 0b36 0000 0b99 000b 05cc 0200 0db5 0500 1cdd 0000 6547 0000 0013 0000 3287
0657260  0093 c363 0000 034b 0000 315f ffff ffff 0300 65bf 0000 3287 0000 000c 000b 5acc 000b 5acc 0001 0069 0000 0000 2c78 0014
0657340  0002 438a 362c 320c 31f0 22bc 000b 4864 0014 3d94 27f0 004c 000b 2024 45b8 46ec 2e7c adec 2ba0 001c 0034 2e7c ae30 2ba0
0657420  001c 0014 3b4c 0000 000a e1e4 001c aa6c 2e98 2c88 0008 2c58 9300 936c aa50 2e98 37f0 39a4 0008 cf5c 000c 2eb0 2c58 c5a8
0657500  28c4 004c 000b 493c 56f8 687c 0020 69b0 4714 4768 3af4 0020 000b 5a9c 0024 3380 001c 3c9c 0000 0020 0012 78d8 0020 33bc
```

```
0657560  3e70 001c 3c48 0000 000c 4118 0018 2ecc 386c 3d30 2420 0000 000b 475c 000b 4a18 0000 0038 b27c b66c 0000 0b38 0000 0b9b
0657640  000b 17e4 0200 0db5 0500 1cdd 0000 65b7 0000 000b 0000 3287 005a 4e83 0000 034b 0000 315f 000b 49c0 0300 65b7 0000 3287
0657720  0000 000c 000b 4c40 000b 1954 0001 0069 0000 0000 0014 3d18 2938 0044 000b 48bc 4e1c 0000 0000 0007 2520 46ec 3ba0 0000
0660000  000a db70 0014 2ecc 3310 39f8 000c 057c 0014 43e4 0200 0df7 6d50 6d0c 4240 0000 0000 3caf 242c 0000 000c 059c 28c4 0054
0660060  000b 4910 4e1c 0000 0000 0007 2520 46ec 4769 3050 3228 3364 379c 6f34 33a0 3d48 4300 0000 0000 3cb7 000a d838 0018 38d4
0660140  3858 41e8 0000 251f 447c 0000 0200 0daf 4b8c 0000 0000 38c7 6d0c 234c 0008 b6fc 28c4 002c 000c 05f0 56f8 671c 5370 2520
0660220  46d8 4754 35c8 39a4 000c 05e0 0014 2ecc 3858 37dc 4354 234c 000a dec8 2954 0084 0002 438a 56f8 671c 687c 001c 46ec 4768
0660300  4550 4af8 0000 5ee7 5370 4568 4b8c 0000 0000 533f 6bb4 4550 4b8c 0000 0000 52c7 6bf4 4568 4b8c 0000 0000 5347 6bb4 4550
0660360  4b8c 0000 0000 5237 6bf4 4568 4b8c 0000 0000 52b7 6bb4 3364 24d0 0000 0012 1110 0020 33a0 382c 001c 4108 0000 000c 4118
0660440  0018 2ecc 386c 37f0 3cf4 234c 000b 475c 000b 5aac 0100 65b7 0000 3287 0000 0004 000b 476c 000b 476c 0001 0069 0000 0000
0660520  0014 3e90 2c78 0030 0002 438a 45b8 46ec 2e7c adec 2ba0 0018 0014 39a4 000a e1e4 0018 aa50 2e98 2330 0008 dd3c 2c58 2330
0660600  000c 06b4 000b 4b4c 0000 0038 b27c b66c 0000 0b41 0000 0ba4 000b 4b50 0200 0db5 0500 1cdd 0000 65df 0000 0013 0000 3287
0660660  005a 3043 0000 034b 0000 315f 2c78 002c 0002 438a 45d0 46ec 33a0 3804 4300 0000 0000 3cd7 000a d838 0018 386c 37f0 3cf4
0660740  242c 0000 000c 06ec 0018 6f70 6572 6174 6f72 5f6e 756d 6265 7273 5f61 6e64 5f69 6473 00b5 0016 6f70 6572 6174 6f72 5f69
0661020  645f 616e 645f 6e75 6d62 6572 0000 315f 2c78 0034 0002 438a 45b8 46ec 4768 2e7c ae30 2ba0 001c 0016 3b4c 0000 000a e1e4
0661100  001c aa6c 2e98 231c 0008 dd7c 2c58 231c 000c 070c 0011 13dc 0200 65e7 0000 3287 0000 0008 000b 4bb4 000b 4bb4 0001 0069
0661160  0000 0000 0013 6f70 6572 6174 6f72 5f69 6e70 7574 5f76 6172 7300 315f 2c78 002c 0002 438a 45d0 46ec 477c 33a0 3804 42ac
0661240  0000 3cd7 000a d838 001c 38e8 386c 37f0 3cf4 234c 000c 0734 000b 4f1c 0000 0038 b27c b66c 0000 0b42 0000 0ba5 000b 4f20
0661320  0200 0db5 0500 1cdd 0000 65e7 0000 0013 0000 3287 005a 57a3 0000 034b 0000 315f 2c78 0034 0002 438a 45b8 46ec 4768 2e7c
0661400  ae30 2ba0 001c 0016 3b4c 0000 000a e1e4 001c aa6c 2e98 231c 0008 c1fc 2c58 231c 000c 070c 2cac 4dd4 0002 438a 2ca0 b66c
0661460  0000 0000 0000 0001 000b 2890 000b 4dd0 000b 4dda 000a 2ed0 27f0 0014 000b 6ad8 4e1c 0000 0000 0007 54a8 228c 2c78 0054
0661540  0002 438a 5d10 0000 0200 0daf 6840 69b0 4700 477c 3050 41fc 0000 0013 37dc 32f0 001c 6f34 44a0 0000 0200 0daf 6d80 6e1c
0661620  001c 39a4 0008 bbbc 001c 3880 3804 43c0 0200 0daf 6d80 6d3c 242c 0000 0008 b6dc 27f0 0054 000b 1954 45dc 4700 4754 3aa0
0661700  0012 4e30 001c 3818 3280 247c 0012 0978 0018 3804 3b4c 0000 0012 04e8 0014 3858 447c 0000 0100 611f 6d0c 43e4 0200 0daf
0661760  4b8c 0000 0000 3287 6b74 4064 0008 c03c 000c 2eb0 0012 78c8 0100 6557 0000 3287 0000 0004 000a 2ea8 000a 2ea8 0001 0069
0662040  0000 0000 000c 8b44 2c78 005c 0002 438a 5d10 0000 0200 0daf 6840 69b0 4700 477c 47f8 001c 4268 0000 0000 001b 37dc 32f0
0662120  0020 6f34 44a0 0000 0200 0daf 6d80 6e1c 0020 39a4 0008 bbbc 0020 38fc 001c 3880 3804 43c0 0200 0daf 6d80 6d3c 242c 0000
0662200  0008 b6fc 27f0 0068 000b 1c68 2520 4728 001c 4754 35c8 32d4 24d0 0000 0012 0978 0020 382c 001c 3aa0 0012 04e8 001c 3348
0662260  3c48 0000 0012 0508 001c 33a0 447c 0000 0100 611f 6dd8 43e4 0200 0daf 4b8c 0000 0000 3287 6b74 408c 0008 c03c 0014 37f0
0662340  40cc 0000 000d 8048 000c 2eb0 0012 5386 0000 0000 2c78 004c 0002 438a 362c 450c 0000 001c 0100 399f 67ec 0018 447c 0000
0662420  0300 3937 4b8c 0000 0000 1f87 6c84 0018 67b8 43e4 0200 0abf 6c84 001c 6b74 43c0 0200 0daf 6c84 0018 6c34 22bc 000c 0694
0662500  2954 0024 0002 438a 56f8 6784 692c 5758 671c 6a00 35ec 247c 000b 4eb4 0014 2330 000b 4af4 27f0 0014 000b 6994 4e1c 0000
0662560  0000 0007 49c8 228c 28c4 0050 000b 4e58 45b8 9300 936c 3050 44a0 0000 0200 0daf 4b8c 0000 0000 2a77 6a00 31f0 24d0 0000
0662640  0008 bbbc 0014 39f8 000c 088c 0014 39f8 000c 08ac 0014 3930 0018 3244 3228 320c 2420 0000 000c 08cc 2954 004c 0002 438a
0662720  2520 34c0 0018 3244 3228 320c 24d0 0000 000c 08cc 0010 43e4 0200 0daf 4b8c 0000 0000 2a77 6d0c 31f0 24d0 0000 0008 bbbc
0663000  0010 39a4 000c 088c 0010 3cf4 242c 0000 000c 08ac 0011 13fc 0200 65ef 0000 3287 0000 0008 000b 4f8c 000b 4f8c 0001 0069
0663060  0000 0000 2954 0014 0002 438a 56f8 5fa0 671c 22bc 000b 6f50 0014 0ab4 2c78 003c 0002 438a 45b8 46ec 3b4c 0000 000a e0bc
0663140  0014 3858 44a0 0000 0300 3937 67ec 0018 6d0c 67b8 447c 0000 0200 0daf 6c84 0018 6c34 234c 000c 0694 000b 5038 0000 0038
0663220  b27c b66c 0000 0b43 0000 0ba6 000b 503c 0200 01b5 0500 1cdd 0000 65ef 0000 0013 0000 3287 005a 75a3 0000 034b 0000 315f
0663300  2c78 003a 0002 438a 45b8 33bc 320c 3774 6f34 aa34 aaf0 fffe ac08 41fc 0000 3d0f 37dc 6e74 aa34 aaf0 ffff ac08 4268 0000
0663360  0000 32d7 37dc 6e74 723c 746f 2c78 0020 0002 438a 45c4 3280 24d0 0000 000b 4608 0014 37f0 3cf4 234c 0012 0508 0016 6f70
0663440  6572 6174 6f72 5f6e 756d 6265 725f 616e 645f 6964 000b 5038 0011 198c 0200 65f7 0000 3287 0000 0008 000b 50b0 000b 50b0
0663520  0001 0069 0000 0000 2c78 0014 0002 438a 36b8 437c 239c 0000 000b 6810 2c78 0036 0002 438a 2520 332c 24d0 0000 0008 ba5c
0663600  0014 33a0 4254 0000 0000 0003 40e0 0000 0008 d2fc 0010 2ecc aa18 aab4 0000 a484 22a0 6d56 000b 52e0 0000 0038 b27c b66c
0663660  0000 0b44 0000 0ba7 000b 52e4 0200 0db5 0500 1cdd 0000 65f7 0000 0013 0000 3287 005a 7ec3 0000 034b 0000 315f 2c78 0042
0663740  0002 438a 45b8 46ec 4768 47e4 4880 0018 001c 9350 001c 93a8 0010 3984 0018 001c 23e4 0000 000c 09cc 9300 93a8 0010 3984
0664020  0018 001c 23e4 0000 000c 09ec c5a8 2c20 2c78 0020 0002 438a 45c4 3280 24d0 0000 000b 09b0 0014 37f0 3cf4 234c 000b 4608
0664100  27f0 0014 000b 59b0 4e1c 0000 0000 0007 54f8 2edc 000b 50dc 2c78 0050 0002 438a 370c 001c 2520 4768 34e0 0018 3430 41fc
0664160  0000 32d7 35c8 35b0 001c 247c 000c 08cc 0018 396c 447c 0000 0100 3cff 6d50 43e4 0200 0daf 4b8c 0000 0000 38c7 6b74 3cf4
0664240  242c 0000 0008 e1bc 0018 6f70 6572 6174 6f72 5f62 6c6f 636b 5f69 6e70 7574 5f69 6473 0000 000f 696f 6e6f 6465 735f 616e
0664320  645f 6964 7300 0000 2c78 007c 0002 438a 45c4 4728 002c 4790 0024 47f8 001c 4848 0018 33a0 3380 0030 3788 6f34 aa18 aaf0
0664400  0001 ae74 0028 aa18 aaf0 0002 ae74 0020 aa18 aaf0 0003 ae30 3880 3e70 0030 379c 6f34 3894 002c 3804 37c4 0028 6e74 3894
0664460  0024 3804 37c4 0020 6e74 3894 001c 3804 37b0 6e74 386c 37f0 40cc 0000 000c 0a1c 000c 2eb0 001a 6f70 6572 6174 6f72 5f62
0664540  6c6f 636b 5f69 6f6e 6f64 655f 6c69 7374 0000 1cdd 0011 696e 7075 7473 5f74 6f5f 636c 7573 7465 7200 0014 0f40 2c78 0038
0664620  0002 438a 45d0 482c 0018 3410 001c 3364 3788 6f34 aa88 001c aaf0 fffd ad64 3844 3d48 379c 6f34 386c 37f0 39a4 000c 0a1c
```

```
0664700  000c 2eb0 0017 696f 6e6f 6465 5f76 6172 6961 626c 655f 6964 5f6c 6973 7400 0db5 0019 5f70 6572 6174 6f72 5f62 6c6f 636b
0664760  5f69 6e70 7574 5f76 6172 7300 2954 0030 0002 438a 45d0 46d8 4754 33f4 37dc 379c 6e74 3d78 37f0 379c 6e74 aa50 aaf0 ffff
0665040  ac08 3858 37dc 234c 000c 0a1c 0011 143c 0200 65ff c000 3287 0000 0008 000b 5384 000b 5384 0001 0069 0000 0000 000b 541c
0665120  0000 0038 b27c b66c 0000 0b45 0000 0ba8 000b 5420 0200 0db5 0500 1cdd 0000 65ff 0000 0013 0000 3287 005a 9663 0000 034b
0665200  0000 315f 2954 0014 0002 438a 56f8 5fa0 671c 22bc 000b 55ec 0014 1078 2c78 0058 0002 438a 45c4 39f8 000a e0bc 0018 3348
0665260  3ba0 0000 000a d55c 0018 3858 3d3c 42ac 0000 2527 c00a d774 0014 34c0 0018 3244 3228 320c 3ba0 0000 000c 08cc 0010 43c0
0665340  0200 0daf 4b8c 0000 0000 2a77 6d0c 234c 0004 db9c 2c78 0034 0002 438a 2520 46ec 33d8 41e8 0000 6077 24d0 0000 000b 53c8
0665420  0018 3310 40f4 0000 000b 53e8 0014 37f0 3cf4 234c 0011 4914 0011 1488 0300 6607 0000 3287 0000 000c 000b 4fe8 000b 4fe8
0665500  0001 0069 0000 0000 0011 42e4 0200 660f 0000 3287 0000 0008 000b 6b8c 000b 6b8c 0001 0069 0000 0000 0011 14c8 0200 6617
0665560  0000 3287 0000 0008 000b 5560 000b 5560 0001 0069 0000 0000 000b 5690 0000 0038 b27c b66c 0000 0b46 0000 0ba9 000b 5694
0665640  0200 0db5 0500 1cdd 0000 6617 0000 0013 0000 3287 005a a043 0000 034b 0000 315f 000e 696f 5f76 616c 7565 735f 6c69 7374
0665720  0000 315f 2938 0060 000c 0bf8 4e1c 0000 0000 313f 2520 4700 3bf4 0000 000a e0bc 0018 33a0 3804 329c 24d0 0000 000a d838
0666000  0014 42ac 0000 06e7 0008 ec1c 0014 4078 0008 ec1c c010 42ac 0000 3d47 0008 ec1c 0010 4064 0008 ec1c 000c 247c 0008 d13c
0666060  000c c5a8 28c4 0070 000b 5534 4e1c 0000 0000 3d4f 2520 46d8 332c 39a4 000c 0c64 0014 4408 0200 3d5f 4b8c 0000 0000 0c83
0666140  4b8c 0000 0000 0643 4254 0000 0000 3d5f 3ba0 0000 000a e30c 0014 41e8 0000 2ae7 3ba0 0000 000a e2ac 0014 41e8 0000 3d67
0666220  3ba0 0000 000a e2ac 0014 3d30 2420 0000 000a d7d8 28c4 002c 000c 0ce4 4e1c 0000 0000 3d6f 2520 33a0 4300 0000 0000 3917
0666300  000a d838 0010 4064 000c 0cb4 000c c5a8 2c78 0034 0002 438a 2520 46ec 33d8 41e8 0000 6077 24d0 0000 000b 53c8 0018 3310
0666360  40f4 0000 000b 55ec 0014 37f0 3cf4 234c 0011 4914 0014 8b68 2c78 0044 0002 438a 45b8 46ec 3050 3410 001c 3348 3788 6f34
0666440  33f4 3804 4300 0000 0000 3d7f 000a d838 0020 3eec 001c 320c 3d18 6f34 3d3c 39a4 000a ddf0 0014 2330 000a dafc 0011 151c
0666520  0200 661f 0000 3287 0000 0008 000b 6dbc 000b 6dbc 0001 0069 0000 0000 001b 6f70 6572 6174 6f72 5f62 6c6f 636b 5f69 6e70
0666600  7574 5f76 616c 7565 7300 0038 0011 23e8 0200 6627 0000 3287 0000 0008 000b 56f8 000b 56f8 0001 0069 0000 0000 000d 696e
0666660  635f 7072 6f78 696d 6974 7900 2c78 0040 0002 438a 45c4 46d8 3858 37f0 4300 0000 0000 3d0f 000a 24a8 0014 3844 37f0 42ac
0666740  0000 1f87 000a 24a8 0014 3858 37dc 41d4 0000 2527 242c 0000 000a 24a8 000b 5918 0000 0038 b27c b66c 0000 0b47 0000 0baa
0667020  000b 591c 0200 0db5 0500 1cdd 0000 6627 0000 0013 0000 3287 005a b163 0000 034b 0000 315f 2c78 0034 0002 438a 370c 001c
0667100  36b8 2520 34c0 0018 4268 0000 0000 32d7 35c8 35b0 001c 247c 000c 08cc 0010 3cf4 242c 0000 000c 08ac 2c78 0034 0002 438a
0667160  2520 46ec 33d8 41e8 0000 6077 24d0 0000 000b 53c8 0018 3310 40f4 0000 000b 578c 0014 37f0 3cf4 234c 0011 4914 0013 e220
0667240  2c78 004c 0002 438a 45d0 46ec 477c 37f0 3bf4 0000 000a d68c 001c 34c0 0018 38e8 4268 0000 0000 32d7 3804 39f8 000c 08cc
0667320  0010 43c0 0200 0daf 4b8c 0000 0000 2a77 6d0c 247c 0008 b2bc 000c 2eb0 0011 1578 0200 662f 0000 3287 0000 0008 000b 6c9c
0667400  000b 6c9c 0001 0069 0000 0000 27f0 0014 000b 6de0 4e1c 0000 0000 0007 54a8 2edc 000b 57a8 2c78 0070 0002 438a 45d0 46ec
0667460  47e4 3540 0018 001c 36b8 41fc 0000 32d7 3804 39f8 000c 08cc 0020 43c0 0200 0daf 4b8c 0000 0000 2a77 6e1c 001c 24d0 0000
0667540  0008 db5c 001c 34c0 0018 38e8 4268 0000 0000 32d7 3804 39f8 000c 08cc 0010 43c0 0200 0daf 4b8c 0000 0000 2a77 6d0c 234c
0667620  0008 b2bc 001e 6f70 6572 6174 6f72 5f62 6c6f 636b 5f69 6e70 7574 5f63 6f6e 7374 616e 7473 0000 38f7 0011 696f 5f63 6f6e
0667700  7374 616e 7473 5f6c 6973 7400 2c78 0040 0002 438a 370c 001c 36b8 2520 34c0 0018 4268 0000 0000 32d7 35c8 35b0 001c 247c
0667760  000c 08cc 0010 43c0 0200 0daf 4b8c 0000 0000 2a77 6d0c 234c 0008 b33c 0011 15ac 0200 6637 0000 3287 0000 0008 000b 5b3c
0670040  000b 5b3c 0001 0069 0000 0000 2954 0014 0002 438a 56f8 5fa0 671c 22bc 000b 5bc0 0014 7d58 2c78 0040 0002 438a 370c 001c
0670120  36b8 2520 34c0 0018 4268 0000 0000 32d7 35c8 35b0 001c 247c 000c 08cc 0010 43c0 0200 0daf 4b8c 0000 0000 2a77 6d0c 234c
0670200  0008 b2fc 000b 5a3c 0000 0038 b27c b66c 0000 0b48 0000 0bab 000b 5ccc 0200 0db5 0500 1cdd 0000 6637 0000 0013 0000 3287
0670260  005a c563 0000 034b 0000 315f 2c78 0040 0002 438a 370c 001c 36b8 2520 34c0 0018 4268 0000 0000 32d7 35c8 35b0 001c 247c
0670340  000c 08cc 0010 43c0 0200 0daf 4b8c 0000 0000 2a77 6d0c 234c 0008 db9c 2cac 719c 0002 438a 2ca0 2e61 0000 0000 0000 0001
0670420  000b 50d0 000b 4ec4 0011 26e8 000b 5ce4 28c4 0068 000b 4ec4 56f8 671c 682c 46ec 57b8 6af0 0020 6a50 382c 0020 24d0 0000
0670500  0012 0734 0024 3c9c 0000 0020 0012 08b8 0024 2ecc 3380 001c 3af4 0020 0012 0648 0020 2e7c ae30 2ba0 0020 0016 37f0 411c
0670560  0000 001c 000c 4158 001c aa6c 2e98 c5a8 2c58 231c 000b 6f50 0011 18f4 0200 66a7 0000 3287 0000 0008 000b 7198 000b 71c8
0670640  0001 0069 0000 0000 000b 5cc8 0000 0038 b27c b66c c000 0b5b 0000 0bbe 000b 7250 0200 0db5 0500 1cdd 0000 66a7 0000 0013
0670720  0000 3287 005a d143 0000 034b 0000 315f 0017 6f70 6572 6174 6f72 5f69 6e70 7574 5f76 6172 735f 6175 7800 3198 0008 af4c
0671000  0100 65af 0000 3287 0000 0004 0012 51b0 0012 51b0 0001 006b 0000 0000 ffff ffff 0200 65b7 0000 3287 0000 0008 000a 2e3c
0671060  000b 1370 0001 0069 0000 0000 2cac 2e40 0002 438a 2ca0 01d8 0000 0000 0000 0001 000b 230c 000b 493c 0011 370c 0011 3984
0671140  2b24 0000 0002 438a 000b 4946 2c78 0040 0002 438a 370c 001c 2520 34c0 0018 3244 4268 0000 0000 32d7 35c8 35b0 001c 247c
0671220  000c 08cc 0010 43c0 0200 0daf 4b8c 0000 0000 2a77 6d0c 234c 0008 db9c 2c78 0034 0002 438a 2520 46ec 33d8 41e8 0000 6077
0671300  24d0 0000 000b 53c8 0018 3310 40f4 0000 000b 5bc0 0014 37f0 3cf4 234c 0011 4914 0014 8218 2c78 003c 0002 438a 45b8 46ec
0671360  3b4c 0000 000a e0bc 0014 3858 44a0 0000 0300 3937 67ec 0018 6d0c 67b8 447c 0000 0200 0df7 6c84 0018 6c34 234c 000c 0694
0671440  0011 3b34 0200 663f 0000 3287 0000 0008 000b 642c 000b 6d2c 0001 0069 0000 0000 27f0 0014 000b 6d50 4e1c 0000 0000 0007
0671520  54a8 228c 000b 5bdc 2c78 003c 0002 438a 45b8 46ec 3b4c 0000 000a e0bc 0014 3858 44e8 0000 0300 3937 67fc 6d0c 67ec 0018
0671600  44a0 0000 0200 17a7 6c84 0018 6c34 234c 000c 0694 001a 6f70 6572 6174 6f72 5f62 6c6f 636b 5f72 6561 6c5f 696e 7075 7473
0671660  0000 1cdd 2954 0014 0002 438a 56f8 5fa0 671c 22bc 000b 578c 0014 8184 2954 002c 0002 438a 5758 67b8 6840 4768 33a0 35c8
0671740  359c 247c 000a d838 0018 386c 37f0 3cf4 242c 0300 000a e36c 0019 6f70 6572 6174 6f72 5f62 6c6f 636b 5f6f 7574 7075 745f
```

```
0672020 6964 7300 0011 1604 0200 6647 0000 3287 0000 0008 000b 5cfc 000b 5cfc 0001 0069 0000 0000 000b 5d50 0000 0038 b27c b66c
0672100 0000 0b49 0000 0bac 000b 5d54 0200 0db5 0500 1cdd 0000 6647 0000 0013 0000 3287 005a e5a3 0000 034b 0000 315f 2c78 0030
0672160 0002 438a 45dc 4700 3310 3aa0 000b 52cc 001c 332c 3c48 0000 000b 5d3c 0018 386c 3d3c 3cf4 242c 0000 000d d6f4 0011 14e8
0672240 0200 664f 0000 3287 0000 0008 000b 5d94 000b 5d84 0001 0069 0000 0000 000b 5f04 0000 0038 b27c b66c 0000 0b4a 0000 0bad
0672320 000b 5f08 0200 0db5 0500 1cdd 0000 664f 0000 0013 0000 3287 005a e9e3 0000 034b 0000 315f 2c78 0028 0002 438a 2520 46ec
0672400 33a0 41e8 0000 5ecf 24d0 0000 000b 53c8 0014 37f0 3cf4 234c 000b 5dbc 0011 16c4 0200 6657 0000 3287 0000 0008 000b 6ab4
0672460 000b 6ab4 0001 0069 0000 0000 2aa8 4c38 000d 4c84 0013 a40a 2c78 003c 0002 438a 45b8 43e4 0200 0daf 4b8c 0000 0000 2a77
0672540 6d0c 31f0 24d0 0000 0008 bbbc 0010 43c0 0200 0daf 4b8c 0000 0000 2a77 6d0c 234c 0008 b67c 001a 6f70 6572 6174 6f72 5f62
0672620 6c6f 636b 5f6f 7574 7075 745f 7661 7273 0000 1cdd 27f0 0014 000b 6cc0 4e1c 0000 0000 0007 54a8 228c 000b 5e40 2c78 0094
0672700 0002 438a 2520 41e8 0000 1f87 4300 0000 0000 1f87 000a d9c4 000c 41fc 0000 1f87 4254 0000 0000 1f87 4300 0000 0000 3cd7
0672760 000a 24a8 000c 4408 0200 0daf 4b8c 0000 0000 38c7 4b8c 0000 0000 2397 4254 0000 0000 1f87 4300 0000 0000 3cb7 000a 24a8
0673040 000c 4408 0200 1f87 4b8c 0000 0000 3d7f 4b8c 0000 0000 3cb7 4254 0000 0000 1f87 4240 0000 0000 3d7f 242c 0000 000a 24a8
0673120 0011 16e4 0200 665f 0000 3287 0000 0008 000b 5f38 000b 5f38 0001 0069 0000 0000 000b 60ac 0000 0038 b27c b66c 0000 0b4b
0673200 0000 0bae 000b 60b0 0200 0db5 0500 1cdd 0000 665f 0000 0013 0000 3287 005a f783 0000 034b 0000 315f 2c78 0034 0002 438a
0673260 2520 46ec 33d8 41e8 0000 5ecf 24d0 0000 000b 53c8 0018 3310 40f4 0000 000b 55ec 0014 37f0 3cf4 234c 0011 4914 0016 6f70
0673340 6572 6174 6f72 5f62 6c6f 636b 5f6f 7574 7075 7473 0000 315f 2c78 0030 0002 438a 45d0 3574 332c 247c 000c 11cc 0018 3228
0673420 3310 379c 6f34 43e4 0200 1f87 6d94 6d50 3cf4 234c 000a dcbc 001c 6f70 6572 6174 6f72 5f62 6c6f 636b 5f6f 7574 7075 745f
0673500 7661 6c75 6573 00dd 2954 0018 0002 438a 56f8 62c0 5758 6bf4 6750 22bc 000b 6428 2c78 0050 0002 438a 45dc 46d8 3588 3348
0673560 24d0 0000 000c 11cc 001c 3228 332c 37b0 6f34 43e4 0200 1f87 6dd8 6d94 3ba0 0000 000a dcbc 0018 3d6c 37f0 42ac 0000 3cb7
0673640 000a 24a8 0014 3d30 2420 0000 000c 12b4 0011 1704 0200 6667 0000 3287 0000 0008 000b 6128 000b 6128 0001 0069 0000 0000
0673720 27f0 0014 000b 6c30 4e1c 0000 0000 0007 54a8 2edc 000b 606c 28c4 0030 000c 133c 2520 46d8 33bc 35c8 4300 0000 0000 3cb7
0674000 000a d838 0014 3d60 37dc 42ac 0000 3cb7 000a 24a8 000c c5a8 000b 6298 0000 0038 b27c b66c 0000 0b4c 0000 0baf 000b 629c
0674060 0200 0db5 0500 1cdd 0000 6667 0000 0013 0000 3287 005b 0283 0000 034b 0000 315f 2c78 0048 0002 438a 45d0 4714 3410 001c
0674140 3804 42ac 0000 1f87 000a d838 0020 33bc 3e70 001c 4300 0000 0000 3d7f 000a d838 001c 33a0 320c 37b0 6f34 38e8 386c 3d30
0674220 3cf4 234c 000c 1368 2c78 0034 0002 438a 2520 46ec 33d8 41e8 0000 5ecf 24d0 0000 000b 53c8 0018 3310 40f4 0000 000b 578c
0674300 0014 37f0 3cf4 234c 0011 4914 000b 4be4 2954 004c 0002 438a 45dc 46d8 4754 47d0 3410 001c 37dc 37b0 6e74 3410 0020 3804
0674360 37b0 6e74 3eec 0020 37f0 411c 0000 001c 000a e3e0 001c aa6c aaf0 ffff ac08 38d4 3858 37dc 242c 0000 000c 1368 0016 696f
0674440 6e6f 6465 735f 6f72 5f76 616c 7565 735f 6c69 7374 0000 0db5 0017 6f70 6572 6174 6f72 5f62 6c6f 636b 5f72 6561 6c5f 696f
0674520 7300 315f 27f0 0030 000c 13d8 2520 46d8 33bc 35c8 4300 0000 0000 3cb7 000a d838 0014 3d60 37dc 42ac 0000 3cd7 000a 24a8
0674600 000c c5a8 0011 1724 0200 666f 0000 3297 0000 0008 000b 6314 000b 6314 0001 0069 0000 0000 27f0 0014 000b 6bb0 4e1c 0000
0674660 0000 0007 54a8 228c 000b 6240 27f0 0048 000c 13f4 45b8 43e4 0200 0daf 6d0c 6aa0 31f0 247c 0008 bbbc 001c 33bc 3348 37b0
0674740 6f34 43e4 0200 0b3f 6d94 6d50 447c 0000 0200 0daf 6d0c 6bb4 24d0 0000 0008 affc 000c c5a8 000b 6528 0000 0038 b27c b66c
0675020 0000 0b4d 0000 0bb0 000b 652c 0200 0db5 0500 1cdd 0000 666f 0000 0013 0000 3287 005b 1123 0000 034b 0000 315f 2c78 0046
0675100 0002 438a 36a4 2520 4740 2e7c ada8 2ba0 0014 0022 3844 43e4 0200 0daf 4b8c 0000 0000 38c7 6c08 247c 0008 e1bc 0014 aa34
0675160 2e98 22a0 2c58 3774 4e1c 0000 0000 0007 723c 0abf 2c78 0034 0002 438a 2520 46ec 33d8 41e8 0000 5ecf 24d0 0000 000b 53c8
0675240 0018 3310 40f4 0000 000b 6428 0014 37f0 3cf4 234c 0011 4914 000b 4e00 2c78 0090 0002 438a 45c4 46d8 9300 936c 3380 001c
0675320 3ba0 0000 0008 ba5c 0020 2e7c ae30 2ba0 0020 0030 44a0 0000 0200 3da7 6e1c 001c 6a50 43c0 0200 0daf 4b8c 0000 0000 38c7
0675400 6bb4 247c 0008 db5c 001c aa6c 2e98 2c88 000c 2c58 32b8 4c70 0000 0003 aa50 aaf0 0001 af34 44a0 0000 0200 3da7 6d50 6d0c
0675460 447c 0000 0200 0daf 4b8c 0000 0000 38c7 6bb4 247c 0008 b2fc 000c 2eb0 0037 2a2a 2a20 5741 524e 494e 473a 2049 676e 6f72
0675540 696e 6720 6174 7465 6d70 7420 746f 2072 6521 6372 6561 7465 2075 7365 7220 6f62 6a65 6374 2000 6422 0011 1744 0200 6677
0675620 0000 3287 0000 0008 000b 6c0c 000b 6c0c 0001 0069 0000 0000 2c78 0018 0002 438a 45b8 39a4 0012 0688 0010 2340 0012 73cc
0675700 2938 0030 000c 14ac 4e1c 0000 0000 3caf 2520 46d8 3050 42ac 0000 3daf 0008 ec1c 0010 39a4 0008 ec1c 000c 234c 0008 d13c
0675760 0028 546f 6f20 6461 6e79 2076 6172 6961 626c 6573 2069 6e20 276e 6577 2720 6f62 6a65 6374 206e 616d 6520 008f 0011 1764
0676040 0300 667f 0000 3287 0000 000c 000b 6624 000b 6624 0001 0069 0000 0000 0014 6f70 6572 6174 6f72 5f69 6f6e 6f64 655f 6c69
0676120 7374 005f 2c78 0040 0002 438a 45c4 46d8 4300 0000 0000 3dd7 0008 ec1c 0014 39f8 0008 ec1c 0010 42ac 0000 3ddf 0008 ec1c
0676200 0010 39a4 0008 ec1c 000c 247c 0008 d13c 000c c5a8 000b 65b8 0000 0038 b27c b66c 0000 0b4e 0000 0bb1 000b 65bc 0200 0db5
0676260 0500 1cdd 0000 667f 0000 001b 0000 3287 005b 25e3 0000 034b 0000 315f 27f0 0058 000c 1588 2520 46d8 33d8 35c8 32d4 247c
0676340 000a d838 001c 332c 447c 0000 0200 0daf 6dd8 6d94 24d0 0000 000b 66d0 0014 3d60 4254 0000 0000 1d17 3b4c 0000 000a e30c
0676420 0010 41e8 0000 3de7 3b4c 0000 000a e2ac 000c c5a8 000b 6824 0000 0038 b27c b66c 0000 0b4f 0000 0bb2 000b 6828 0200 0db5
0676500 0500 1cdd 0000 6607 0000 001b 0060 3287 005a 9e43 0000 034b 0000 315f 2954 0038 0002 438a 45b8 46ec 3348 39a4 000b 66d0
0676560 0018 43e4 0100 3d4f 6d94 39f8 000a dcbc 0014 3858 37dc 41d4 0000 3d4f 242c 0000 000a e3e0 2c78 0064 0002 438a 45e8 0024
0676640 4728 0020 4754 3380 001c 3c9c 0000 0024 000b 52cc 0028 3364 3af4 0024 000b 5d3c 0024 3894 0020 3818 3af4 001c 000d d6f4
0676720 0020 33d8 3e70 001c 4108 0000 000d d6f4 0018 333c 3280 247c 000b 5dbc 0014 37f0 3cf4 234c 000b 53e8 2c78 0010 0002 438a
0677000 239c 0000 0012 3894 0023 2f68 6f6d 652f 6f73 6173 322f 622f 7175 696e 7475 732f 7077 312e 312f 6c69 6272 6172 7900 315f
0677060 0008 d2cc 0200 3a5f 0000 39cf 0000 0008 000b b998 000b b998 0001 0049 0000 0000 0011 bd90 000a db50 0004 6578 7072 0000
```

```
0677140 0008 d2ec 0200 3a67 0000 39cf 0000 0008 000c 0378 000b ba28 0001 0049 0000 0000 0010 dd30 000e 425c 0010 dd10 000e 42fc
0677220 0008 e10c 0300 2e7f 0000 39cf 0000 000c 000c 03fc 000c 03fc 0001 0049 0000 0000 000a 4478 0000 0000 000b 3f84 000b 6740
0677300 ffff ffff 0300 3a6f 0000 39cf 0000 000c 000c 03d4 000c 03d4 0001 0049 0000 0000 0000 3a6f b328 678a 000b 2138 0000 0000
0677360 000a df7c 0300 3a77 0000 39cf 0000 000c 000b bb08 000b bb08 0001 0049 0000 0000 0000 3a77 b328 67b2 000b 216c 0000 0000
0677440 000a 34b4 0000 0000 0010 dcd0 000e 4194 0008 d38c 0300 3a7f 0000 39cf 0000 000c 000b bb78 000b bb78 0001 0049 0000 0000
0677520 0000 3a7f b328 67f2 000b 21a0 0000 0000 000a 6f6e 746f 5f63 6861 7273 0000 0007 000b 53b8 0400 6607 0000 3287 0000 0010
0677600 000b 6858 000b 6858 0001 0069 0000 0000 000b 69fc 0000 0038 b27c b66c 0000 0b50 0000 0bb3 000b 6a00 0200 0db5 0500 1cdd
0677660 0000 6607 0000 0023 0000 3287 005b 4083 0000 034b 0000 315f 2cac 6998 0002 438a 2ca0 b66c 0000 0000 0000 0001 000b 4df4
0677740 000b 6994 000b 699e 000b 6348 0018 7d74 0010 1b68 0000 0034 0007 f964 b27c b66c 0000 00cb 7fff ffff 000b 8c00 0200 0db5
0700020 0400 24ad 0000 1d17 0000 001b 0000 39cf 0000 3a8f 0000 315f 002b 2f68 6f6d 652f 6f73 6173 322f 622f 7175 696e 7475 732f
0700100 7077 312e 312f 6c69 6272 6172 792f 6368 6172 7369 6f00 7569 002e 2f68 6f6d 652f 6f73 6173 322f 622f 7175 696e 7475 732f
0700160 7077 312e 312f 6c69 6272 6172 792f 6368 6172 7369 6f2e 706c 000a 0a3a 0036 2f68 6f6d 652f 6f73 6173 322f 622f 7175 696e
0700240 7475 732f 6765 6e65 7269 632f 7170 6c69 6232 2e35 2f6c 6962 7261 7279 2f63 6861 7273 696f 006f 6e6d 0039 2f68 6f6d 652f
0700320 6f73 6173 322f 622f 7175 696e 7475 732f 6765 6e65 7269 632f 7170 6c69 6232 2e35 2f6c 6962 7261 7279 2f63 6861 7273 696f
0700400 2e70 6c00 2954 0044 0002 438a 56f8 671c 682c 46ec 4790 001c 47e4 3410 0020 37f0 24d0 0000 000b 69e8 0024 33d8 3e70 0020
0700460 3af4 001c 000c 4118 001c 2ecc 38e8 3d6c 2410 0000 000b 6810 0011 1784 0300 6687 0000 3287 0000 000c 000b 6a30 000b 6a30
0700540 0001 0069 0000 0000 000b 6a80 0000 0038 b27c b66c 0000 0b51 0000 0bb4 000b 6a84 0200 0db5 0500 1cdd 0000 6687 0000 001b
0700620 0000 3287 005b 4f43 0000 034b 0000 315f 2c78 004c 0002 438a 2520 4700 4754 35c8 3280 247c 0012 0648 0018 3804 3b4c 0000
0700700 0012 0628 0014 3858 447c 0000 0100 611f 6d0c 43e4 0200 0daf 4b8c 0000 0000 3287 6b74 3cf4 242c 0000 0008 c03c 000b 6bd8
0700760 0000 0038 b27c b66c 0000 0b52 0000 0bb5 000b 6b24 0200 0db5 0500 1cdd 0000 6657 0000 0013 0000 3287 005a ede3 0000 034b
0701040 0000 315f 2cac 8b78 0002 438a 2ca0 206f 0000 0000 0000 0001 000b 4bd8 000b 6ad8 000b 6ae2 000b 615c 2954 0024 0002 438a
0701120 56f8 671c 682c 5758 6750 6a00 24d0 0000 000b 6b0c 0014 2330 000b 5dbc 0011 17e0 0200 668f 0000 3287 0000 0008 000b 6438
0701200 000b 6438 0001 0069 0000 0000 0000 0060 000b 3b5c b27c b66c 0000 13a8 7fff ffff 000b 6f68 0200 0db5 0500 6945 0200 61bd
0701260 0200 0ad5 0000 2ad7 0000 0023 0100 61bd 0200 0ad5 0000 6317 0000 0033 0100 61bd 0200 0ad5 0000 6317 0000 001b 0000 8b07
0701340 0000 0013 0000 0013 0000 315f 0100 61bf b328 9f43 000b 708c 0000 0000 2cac 8b78 0002 438a 2ca0 6d65 0000 0000 0000 0001
0701420 000b 6234 000b 6bb0 000b 6bba 000b 6248 2954 0024 0002 438a 56f8 671c 682c 5758 6750 6a00 24d0 0000 0012 0734 0014 2330
0701500 000b 53e8 000b 6c68 0000 0038 b27c b66c 0000 0b55 0000 0bb8 000b 6c6c 0200 0db5 0500 1cdd 0000 6677 0000 0013 0000 3287
0701560 005b 2143 0000 034b 0000 315f 2cac 8b78 0002 438a 2ca0 283f 0000 0000 0000 0001 000b 6060 000b 5fd8 000b 09c0 000b 6074
0701640 28c4 0034 000b 5fd8 56f8 671c 682c 5758 6a50 6a00 3804 247c 0012 0734 0018 9328 9410 3a4c 0012 07d8 0014 2ecc 2410 0000
0701720 000b 6428 000b 6cf8 0000 0038 b27c b66c 0000 0b56 0000 0bb9 000b 6cfc 0200 0db5 0500 1cdd 0000 662f 0000 0013 0000 3287
0702000 005a bc63 0000 034b 0000 315f 2cac 8b78 0002 438a 2ca0 656d 0000 0000 0000 0001 000b 5e34 000b 5c44 0011 2b60 000b 5e48
0702060 28c4 0034 000b 5c44 56f8 671c 682c 5758 6a50 6a00 3804 247c 0012 0734 0018 9328 9410 3a4c 0012 07d8 0014 2ecc 2410 0000
0702140 000b 578c 000b 6d88 0000 0038 b27c b66c 0000 0b57 0000 0bba 000b 6d8c 0200 0db5 0500 1cdd 0000 663f 0000 0013 0000 3287
0702220 005a de03 0000 034b 0000 315f 2cac 8b78 0002 438a 2ca0 7228 0000 0000 0000 0001 000b 5bd0 000b 58bc 0011 29e8 000b 5be4
0702300 28c4 0034 000b 58bc 56f8 671c 682c 5758 5a50 6a00 3804 247c 0012 0734 0018 9328 9410 3a4c 0012 07f8 0014 2ecc 2410 0000
0702360 000b 5bc0 000b 6ee0 0000 0038 b27c b66c 0000 0b58 0000 0bbb 000b 6ee4 0200 0db5 0500 1cdd 0000 661f 0000 0013 0000 3287
0702440 005a af63 0000 034b 0000 315f 2cac 8b78 0002 438a 2ca0 6174 0000 0000 0000 0001 000b 579c 000b 5314 0011 28bc 000b 57b0
0702520 28c4 005c 000b 6e3c 56f8 671c 682c 5758 6a50 6a00 3804 247c 0012 0734 0018 9328 9410 2ba0 0018 0010 3bf4 0000 0012 07d8
0702600 0018 2c88 001e 2c30 000e 3a4c 0012 5010 0018 2c88 000e 2c58 3bf4 0000 0012 07f8 0014 2ecc 2410 0000 000b 55ec 28c4 0064
0702660 000b 5314 56f8 671c 682c 5758 6a50 6a00 3380 001c 24d0 0000 0012 0734 0020 9350 001c 9410 3af4 001c 0012 08b8 0020 3e70
0702740 001c 32d4 24d0 0000 0012 0688 001c 3aa0 0012 08d8 001c 3804 4108 0000 0012 0734 0018 9328 9410 2ecc 2410 0000 000b 55ec
0703020 0016 696f 5f63 6c75 7374 6572 5f69 6e70 7574 735f 6c69 7374 002f 3220 0011 1838 0200 6697 0000 3287 0000 0008 000b 6f14
0703100 000b 6f14 0001 0069 0000 0000 000b 70ec 0000 0038 b27c b66c 0000 0b59 0000 0bbc 000b 6f68 0200 0db5 0500 1cdd 0000 6697
0703160 0000 0013 0000 3287 005b 7663 0000 034b 0000 315f 2c78 002c 0002 438a 45c4 4700 33a0 41e8 0000 6077 3ba0 0000 000b 53c8
0703240 0018 386c 37f0 3cf4 242c 0000 000b 6f50 0012 73bc 0300 669f 0000 3287 0000 000c 000b 598c 000b 598c 0001 0069 0000 0000
0703320 0000 0060 000b 6b24 b27c b66c 0000 13a9 7fff ffff 000b 6fc8 0200 0db5 0500 6945 0200 61bd 0200 0ad5 0000 2ad7 0000 001b
0703400 0100 61bd 0200 0ad5 0000 6317 0000 0033 0100 61bd 0200 0ad5 0000 6317 0000 001b 0000 8b07 0000 000b 0000 000b 0000 315f
0703460 0000 0060 000b 6f68 b27c b66c 0000 13aa 7fff ffff 000b 7028 0200 0db5 0500 6945 0200 61bd 0200 0ad5 0000 2ad7 0000 0013
0703540 0100 61bd 0200 0ad5 0000 6317 0000 0033 0100 61bd 0200 0ad5 0000 6317 0000 001b 0000 8b07 0000 000b 0000 000b 0000 315f
0703620 0000 0060 000b 6fc8 b27c b66c 0000 13ab 7fff ffff 000a 2c15 0200 0db5 0500 6945 0200 61bd 0200 0ad5 0000 2ad7 0000 000b
0703700 0100 61bd 0200 0ad5 0000 6317 0000 002b 0100 61bd 0200 0ad5 0000 6317 0000 001b 0000 8b07 0000 001b 0000 001b 0000 315f
0703760 0000 003c 000b 7088 b130 b66c 0000 13ac 7fff ffff 000b 70c5 0200 0db5 0300 6975 0100 61bd 0200 0ad5 0000 6317 0000 001b
0704040 0000 8b07 0000 0023 0000 315f 0000 002c 000b 70c4 b4f0 b4e4 0000 13ab 7fff ffff 0012 ec69 0000 0000 0000 0001 000b 7088
0704120 0002 438a 001a 41e4 000b 724c 0000 0038 b27c b66c 0000 13ad 0000 13ce 000b 839c 0200 0db5 0500 1cdd 0000 8a2f 0000 001b
0704200 0000 3287 00ce 8f03 0000 046b 0000 315f 0000 004c 000b 8350 b27c b66c 0000 13ae 7fff ffff 000a 214c 0200 0db5 0300 8a2d
```

```
0704260  0200 61bd 0200 0ad5 0000 2ad7 0000 000b 0100 61bd 0200 0ad5 0000 6317 0000 002b 0000 74b7 0000 000b 0000 315f 0000 002c
0704340  00Cb 7174 b4f0 b4e4 0000 13ad 7fff ffff 0019 d1e1 0000 0000 0000 0001 000b 7128 0002 438a 001a 41e8 27f0 0030 000b 71c8
0704420  45d0 46ec 3bf4 0000 0012 1020 0018 3310 3bf4 0000 0012 0508 0014 37f0 40cc 0000 000b 5a28 000c 2eb0 2954 0060 0002 438a
0704500  45dc 46ec 3c48 0000 0012 4e9c 001c 3818 32b8 247c 0012 0648 0018 41e8 0000 6077 3bf4 0000 0012 0628 0018 33a0 447c 0000
0704560  0100 611f 6d94 43e4 0200 0daf 4b8c 0000 0000 3287 6b74 408c 0008 c03c 0014 37f0 3cf4 234c 000b 7238 0011 1914 0200 66af
0704640  0000 3287 0000 0008 000b 7294 000b 7294 0001 0069 0000 0000 000b 7378 0000 0038 b27c b66c 0000 0b5c 0000 0bbf 000b 737c
0704720  0200 0db5 0500 1cdd 0000 66af 0000 0013 0000 3287 005b 91c3 0000 034b 0000 315f 27f0 0014 000b 72b8 4e1c 0000 0000 0007
0705000  54a8 2edc 2cac 8b78 0002 438a 2ca0 746f 0000 0000 0000 0001 000b 7280 000b 72e4 0011 253c 0011 26f4 28c4 002c 000b 72e4
0705060  56f8 671c 682c 5758 6a50 6a00 3804 247c 0012 0734 0018 3a4c 0012 07d8 0014 2330 000b 7238 2954 0058 0002 438a 56f8 671c
0705140  682c 5758 6aa0 6a00 3380 001c 24d0 0000 0012 0734 0020 3c9c 0000 001c 0012 08b8 0020 3e70 001c 32b8 24d0 0000 0012 0688
0705220  001c 3a4c 0012 08d8 001c 3818 40f4 0000 0012 0734 0014 2330 000b 7238 0014 6f70 6572 6174 6f72 5f6f 7574 7075 745f 7661
0705300  7273 007b 0011 194c 0200 66b7 0000 3287 0000 0008 000b 73ac 000b 73f8 0001 0069 0000 0000 000b 747c 0000 0038 b27c b66c
0705360  0000 0b5d 0000 0bc0 000b 7480 0200 0db5 0500 1cdd 0000 66b7 0000 0013 0000 3287 005b 9b23 0000 034b 0000 315f 27f0 0030
0705440  000b 73f8 45d0 46ec 3bf4 0000 0012 1020 0018 3310 3bf4 0000 0012 0508 0014 37f0 40cc 0000 000b 7364 000c 2eb0 0018 6f70
0705520  6572 6174 6f72 5f6f 7574 7075 745f 7661 7273 5f61 7578 00e7 2954 0060 0002 438a 451c 46ec 3c48 0000 0012 4e9c 001c 3818
0705600  32b8 247c 0012 0648 0018 41e8 0000 5ecf 3bf4 0000 0012 0628 0018 33a0 447c 0000 0100 611f 6d94 43e4 0200 0daf 4b8c 0000
0705660  0000 3287 6b74 408c 0008 c03c 0014 37f0 3cf4 234c 000b 7468 0011 2b40 0200 66bf 0000 3287 0000 0008 000b 74c4 000b 74c4
0705740  0001 0069 0000 0000 000b 7530 0000 0038 b27c b66c 0000 0b5e 0000 0bc1 000b 7534 0200 0db5 0500 1cdd 0000 66bf 0000 0013
0706020  0000 3287 005b a343 0000 034b 0000 315f 27f0 0014 000b 74e8 4e1c 0000 0000 0007 54a8 2edc 2cac 8b78 0002 438a 2ca0 0b3f
0706100  0000 0000 0000 0001 000b 74b0 000b 74e8 000b 74f2 0011 2548 2954 0024 0002 438a 56f8 671c 682c 5758 6750 6a00 24d0 0000
0706160  0012 0734 0014 2330 000b 7468 0011 19ac 0300 66c7 0000 3287 0000 000c 000b 7564 000b 7564 0001 0069 0000 0000 000b 75a0
0706240  0000 0038 b27c b66c 0000 0b5f 0000 0bc2 000b 75a4 0200 0db5 0500 1cdd 0000 66c7 0000 001b 0000 3287 005b a8e3 0000 034b
0706320  0000 315f 2c78 0018 0002 438a 36b8 3640 35c8 31f0 239c 0000 000b 758c 000b 750c 0400 66c7 0000 3287 0000 0010 000b 75d4
0706400  000b 75d4 0001 0069 0000 0000 000b 7668 0000 0038 b27c b66c 0000 0b60 0000 0bc3 000b 766c 0200 0db5 0500 1cdd 0000 66c7
0706460  0000 0023 0000 3287 005b ac63 0000 034b 0000 315f 2c78 005c 0002 438a 2520 4714 4768 47bc 35c8 3280 24d0 0000 0012 0648
0706540  001c 3818 3b4c 0000 0012 0668 0018 3304 3b4c 0000 0012 0628 0014 3858 447c 0000 0100 611f 6d0c 43e4 0200 0daf 4b8c 0000
0706620  0000 3287 6b74 3cf4 242c 0000 0008 c03c 000e 696f 6e6f 6465 5f69 645f 6c69 7374 0000 32bf 0011 19e4 0300 66cf 0000 3287
0706700  000c 000c 000b 769c 000b 769c 0001 0069 0000 0000 000b 76d8 0000 0038 b27c b66c 0000 0b61 0000 0bc4 000b 76dc 0200 0db5
0706760  0500 1cdd 0000 66cf 0000 001b 0000 3287 005b b2a3 0000 034b 0000 315f 2c78 0018 0002 438a 36b8 3640 35c8 31f0 239c 0000
0707040  000b 76c4 000b 7644 0400 66cf 0000 3287 0000 0010 000b 770c 000b 770c 0001 0069 0000 0000 000b 7798 0000 0038 b27c b66c
0707120  0000 0b62 0000 0bc5 000b 779c 0200 0db5 0500 1cdd 0000 66cf 0000 0023 0000 3287 005b b623 0000 034b 0000 315f 2c78 0068
0707200  0002 438a 2520 4728 001c 477c 47d0 35c8 329c 247c 0012 0648 0020 382c 001c 39f8 0012 0668 001c 3818 3ba0 0000 0012 0628
0707260  0018 3310 3ba0 0000 0012 0688 0018 386c 447c 0000 0100 611f 6d50 43e4 0200 0daf 4b8c 0000 0000 3287 6b74 3cf4 242c 0000
0707340  0008 c03c 0011 1a54 0200 66d7 0000 3287 0000 0008 000b 77cc 000b 77cc 0001 0069 0000 0000 000b 7804 0000 0038 b27c b66c
0707420  0000 0b63 0000 0bc6 000b 7808 0200 0db5 0500 1cdd 0000 66d7 0000 0013 0000 3287 005b bc23 0000 034b 0000 315f 2c78 0014
0707500  0002 438a 3640 35c8 31f0 22bc 000b 77f0 000b 7774 0300 66d7 0000 3287 0000 000c 000b 7838 000b 7838 0001 0069 0000 0000
0707560  000b 7888 0000 0038 b27c b66c 0000 0b64 0000 0bc7 000b 788c 0200 0db5 0500 1cdd 0000 66d7 0000 001b 0000 3287 005b bf83
0707640  0000 034b 0000 315f 2c78 002c 0002 439a 2520 4754 33d8 247c 000b 751c 0018 3310 40f4 0000 000b 7874 0014 37f0 3cf4 234c
0707720  0011 4914 0011 1a74 0200 66df 0000 3287 0000 0008 000b 78d0 000b 78d0 0001 0069 0000 0000 000b 79a0 0000 0038 b27c b66c
0710000  0000 0b65 0000 0bc8 000b 79a4 0200 0db5 0500 1cdd 0000 66df 0000 0013 0000 3287 005b c3a3 0000 034b 0000 315f 27f0 0014
0710060  000b 78f4 4e1c 0000 0000 0007 54a8 2edc 2cac 8b78 0002 438a 2ca0 78e1 0000 0000 0000 0001 000b 78bc 000b 793c 0010 e39c
0710140  0010 e618 28c4 0048 000b 793c 56f8 671c 682c 5758 6a50 6a00 3904 247c 0012 0734 0018 2ba0 0018 0010 3bf4 0000 0012 07d8
0710220  0018 2c88 000e 2c58 3bf4 0000 0012 07f8 0014 2ecc 2410 0000 000b 7874 2954 0014 0002 438a 56f8 5fa0 671c 22bc 000b 7874
0710300  000f 6461 7461 5f64 6570 656e 6465 6e63 7900 24f7 0012 7072 6563 6564 6573 5f69 6d6d 6564 6961 7465 000b 6822 0011 1aac
0710360  0200 66e7 0000 3287 0000 0008 000b 7934 000b 7a24 0001 0069 0000 0000 000b 7a6c 0000 0038 b27c b66c 0000 0b66 0000 0bc9
0710440  000b 7a70 0200 01b5 0500 1cdd 0000 66e7 0000 0013 0000 3287 005b cc63 0000 034b 0000 315f 27f0 0030 000b 7a24 45c4 46d8
0710520  2ba0 0014 0012 37dc 3ba0 0000 000b 7a14 0014 2c88 000e 2c58 37f0 39a4 000b 7a14 000c 2eb0 0011 1af4 0200 66ef 0000 3287
0710600  0000 0008 000b 7aa0 000b 7aa0 0001 0069 0000 0000 2954 0024 0002 438a 45c4 46d8 2ba0 0014 000c 37dc 3788 234c 000b 7a58
0710660  2c58 2330 000b 7a58 0011 63bc 0200 66f7 0000 3287 0000 0008 0010 de24 000b 7b98 0001 0069 0000 0000 000b 7bbc 0000 0038
0710740  b27c b66c 0000 0b67 0000 0bca 000b 7b68 0200 0db5 0500 1cdd 0000 66ef 0000 0013 0000 3287 005b d0a3 0000 034b 0000 315f
0711020  2c78 0060 0002 438a 45b8 4700 2ba0 0018 000a 9300 9410 2c88 000e 2c58 3b4c 0000 0012 7690 0018 2ba0 0018 000a 9328 9410
0711100  2c88 000c 2c58 3a4c 0012 7690 0018 3804 3b4c 0000 000b 7b10 0018 332c 3bf4 0000 000b 7b30 0014 3d30 2420 0000 000b 7b50
0711160  0011 1b68 0200 66ff 0000 3287 0000 0008 000b 7ce0 000b 7ce0 0001 0069 0000 0000 0011 1b88 0200 6707 0000 3287 0000 0008
0711240  000b 7bf0 000b 7bf0 0001 0069 0000 0000 0011 1bfc 0200 670f 0000 3287 0000 0008 000b 7c78 000b 7c78 0001 0069 0000 0000
0711320  2938 0020 0012 9a1c 4e1c 0000 0000 52b7 4240 0000 0000 5ed7 239c 0000 0011 ffa0 0013 6172 6368 6974 6563 7475 7265 5f6e
```

```
0711400  756d 6265 7200 315f 2954 0020 0002 438a 45b8 329c 24d0 0000 000b 7a14 0014 3d30 2420 0000 000b 7a58 000b 7c44 0000 0038
0711460  b27c b66c 0000 0b69 0000 0bcc 000b 7c48 0200 0db5 0500 1cdd 0000 6707 0000 0013 0000 3287 005b d983 0000 034b 0000 315f
0711540  2c78 0050 0002 438a 45e8 001c 46ec 3c9c 0000 001c 0012 7690 0020 3364 3af4 001c 0012 0548 001c 3d48 32b8 247c 000c 4138
0711620  0018 3d3c 3280 247c 0012 0688 0014 39a4 0012 73cc 0014 37f0 3cf4 234c 0012 0734 000b 7cac 0000 0038 b27c b66c 0000 0b6a
0711700  0000 0bcd 000b 7cb0 0200 0db5 0500 1cdd 0000 670f 0000 0013 0000 3287 005b da83 0000 034b 0000 315f 2c78 0030 0002 438a
0711760  45d0 46d8 3bf4 0000 0012 7690 0018 332c 3bf4 0000 0012 0568 0014 3d30 3b4c 0000 000c 4138 000c 2eb0 000b 7424 0000 0038
0712040  b27c b66c 0000 0b6b 0000 0bce 000b 7d28 0200 0db5 0500 1cdd 0000 66ff 0000 0013 0000 3287 005b d883 0000 034b 0000 315f
0712120  2c78 0020 0002 438a 2520 46d8 332c 247c 0012 0978 0014 3d30 2420 0000 0012 0978 0011 5720 0100 6717 0000 3287 0000 0004
0712200  000b 7d58 000b 7d58 0001 0069 0000 0000 000b 7dc4 0000 0038 b27c b66c 0000 0b6c 0000 0bcf 000b 7dc8 0200 0db5 0500 1cdd
0712260  0000 6717 0000 000b 0000 3287 005b e883 0000 034b 0000 315f 2c78 0034 0002 438a 45c4 39f8 0012 7690 0014 2e7c ad64 2ba0
0712340  0014 0016 37f0 31f0 24d0 0000 000b 7a58 0010 aa18 2e98 c5a8 2c58 723c 000e 6672 6565 5f6f 7065 7261 746f 7273 0000 21cf
0712420  0011 1c8c 0100 671f 0000 3287 0000 0004 000b 7df8 000b 7df8 0001 0069 0000 0000 000b 7e58 0000 0038 b27c b66c 0000 0b6d
0712500  0000 0bd0 000b 7e5c 0200 0db5 0500 1cdd 0000 671f 0000 000b 0000 3287 005b ed83 0000 034b 0000 315f 2c78 0028 0002 438a
0712560  362c 442c 0100 6717 671c 43e4 0200 0daf 4b8c 0000 0000 3287 6c34 22bc 0008 c03c 0011 6672 6565 5f6f 7065 7261 746f 725f
0712640  6964 7300 0011 1cac 0100 6727 0000 3287 0000 0004 000b 7e8c 000b 7e8c 0001 0069 0000 0000 000b 7f0c 0000 0038 b27c b66c
0712720  0000 0b6e 0000 0bd1 000b 7f10 0200 0db5 0500 1cdd 0000 6727 0000 000b 0000 3287 005b f223 0000 034b 0000 315f 2c78 0044
0713000  0002 438a 362c 450c 0000 0018 0100 6717 671c 43e4 0200 6067 6b74 671c 44e8 0000 0200 0abf 6c84 0018 6bb4 43e4 0200 0daf
0713060  4b8c 0000 0000 3287 6c34 22bc 0008 c03c 0012 6465 7065 6e64 616e 745f 6f70 6572 6174 6f72 003d 3fc3 0011 1cec 0100 672f
0713140  0000 3287 0000 0004 000b 7f40 000b 7f40 0001 0069 0000 0000 000b 7f90 0000 0038 b27c b66c 0000 0b6f 0000 0bd2 000b 7f94
0713220  0200 0db5 0500 1cdd 0000 672f 0000 000b 0000 3287 005b f7c3 0000 034b 0000 315f 2c78 0014 0002 438a 35c8 31f0 239c 0000
0713300  000b 7a14 0013 6465 7065 6e64 616e 745f 6f70 6572 6174 6f72 7300 c4e3 0011 1d3c 0100 6737 0000 3287 0000 0004 000b 7fc4
0713360  000b 7fc4 0001 0069 0000 0000 000b 803c 0000 0038 b27c b66c 0000 0b70 0000 0bd3 000b 8040 0200 0db5 0500 1cdd 0000 6737
0713440  0000 000b 0000 3287 005b fbe3 0000 034b 0000 315f 2c78 0038 0002 438a 45c4 33a0 44e8 0000 0100 672f 671c 43e4 0200 0daf
0713520  4b8c 0000 0000 3287 6c34 247c 0008 c03c 0014 37f0 3cf4 234c 000d d574 0016 6465 7065 6e64 616e 745f 6f70 6572 6174 6f72
0713600  5f69 6473 0000 2167 0011 4344 0100 673f 0000 3287 0000 0004 000b 8070 000b 8070 0001 0069 0000 0000 000b 8398 0000 0038
0713660  b139 b66c 0000 0b71 0000 0bd4 000a 2a61 0200 01b5 0500 1cdd 0000 673f 0000 000b 0000 3287 005c 0143 0000 034b 0000 315f
0713740  2c78 0050 0002 438a 45c4 33a0 4450 0018 0100 672f 671c 43e4 0200 6067 6b74 671c 44e8 0000 0200 0abf 6c84 0018 6bb4 43e4
0714020  0200 0daf 4b8c 0000 0000 3287 6c34 247c 0008 c03c 0014 37f0 3cf4 234c 000d d574 0007 5167 4368 6172 7300 80d4 0010 df34
0714100  0010 1c00 b464 90c4 0013 f37c 0000 0000 0012 9a48 0000 0000 0000 004c 000a 2d4c b27c b66c 0000 13b0 7fff ffff 000b 813c
0714160  0200 0db5 0300 8a2d 0200 61bd 0200 0ad5 0000 2ad7 0000 001b 0100 61bd 0200 0ad5 0000 6317 0000 0033 0000 7497 0000 002b
0714240  0000 315f 0000 004c 000b 80f0 b27c b66c 0000 13b1 7fff ffff 000b 8188 0200 0db5 0300 8a2d 0200 61bd 0200 0ad5 0000 2ad7
0714320  0000 0023 0100 61bd 0200 0ad5 0000 6317 0000 0033 0000 7497 0000 0023 0000 315f 0000 004c 000b 813c b27c b66c 0000 13b2
0714400  7fff ffff 000b 81d4 0200 0db5 0300 8a2d 0200 61bd 0200 0ad5 0000 2ad7 0000 002b 0100 61bd 0200 0ad5 0000 6317 0000 0033
0714460  0000 7497 0000 0023 0000 315f 0000 004c 000b 8188 b27c b66c 0000 13b3 7fff ffff 000b 8220 0200 0db5 0300 8a2d 0200 61bd
0714540  0200 0ad5 0000 2ad7 0000 0033 0100 61bd 0200 0ad5 0000 6317 0000 0033 0000 7477 0000 0013 0000 315f 0000 004c 000b 81d4
0714620  b27c b66c 0000 13b4 7fff ffff 000b 826c 0200 0db5 0300 8a2d 0200 61bd 0200 0ad5 0000 2ad7 0000 003b 0100 61bd 0200 0ad5
0714700  0000 6317 0000 0033 0000 7497 0000 002b 0000 315f 0000 004c 000b 8220 b27c b66c 0000 13b5 7fff ffff 000b 82b8 0200 0db5
0714760  0300 8a2d 0200 61bd 0200 0ad5 0000 2ad7 0000 0043 0100 61bd 0200 0ad5 0000 6317 0000 0033 0000 7497 0000 002b 0000 315f
0715040  0000 004c 000b 826c b27c b66c 0000 13b6 7fff ffff 000b 8304 0200 0db5 0300 8a2d 0200 61bd 0200 0ad5 0000 2ad7 0000 004b
0715120  0100 61bd 0200 0ad5 0000 6317 0000 0033 0000 7477 0000 0013 0000 315f 0000 004c 000b 82b8 b27c b66c 0000 13b7 7fff ffff
0715200  000b 8350 0200 0db5 0300 8a2d 0200 61bd 0200 0ad5 0000 2ad7 0000 0053 0100 61bd 0200 0ad5 0000 6317 0000 0033 0000 7487
0715260  0000 001b 0000 315f 0000 004c 000b 8304 b27c b66c 0000 13b8 7fff ffff 000b 7175 0200 0db5 0300 8a2d 0200 61bd 0200 0ad5
0715340  0000 2ad7 0000 005b 0100 61bd 0200 0ad5 0000 6317 0000 0033 0000 7487 0000 001b 0000 315f 000b 87d8 0000 0038 b130 b66c
0715420  0000 13b9 0000 13cf 000a 2b51 0200 0db5 0500 1cdd 0000 5357 0000 001b 0000 3287 00ce 5ee3 0000 046b 0000 315f 0000 004c
0715500  000b 92f0 b27c b66c 0000 13ba 7fff ffff 000b 844c 0200 0db5 0300 5355 0200 61bd 0200 0ad5 0000 32cf 0000 0073 0100 61bd
0715560  0200 0ad5 0000 6317 0000 001b 0000 8b0f 0000 8b17 0000 315f 0000 002c 000b 8420 b4f0 b4e4 0000 13b9 7fff ffff 0019 cbdd
0715640  0000 0000 0000 0001 000b 83d4 0002 438a 001a 4260 0000 004c 000b 83d4 b27c b66c 0000 13bb 7fff ffff 000b 8498 0200 0db5
0715720  0300 5355 0200 61bd 0200 0ad5 0000 32cf 0000 006b 0100 61bd 0200 0ad5 0000 6317 0000 001b 0000 8b1f 0000 8b27 0000 315f
0716000  0000 004c 000b 844c b27c b66c 0000 13bc 7fff ffff 000b 84e4 0200 0db5 0300 5355 0200 61bd 0200 0ad5 0000 32cf 0000 0063
0716060  0100 61bd 0200 0ad5 0000 6317 0000 001b 0000 8b2f 0000 8b37 0000 315f 0000 004c 000b 8498 b27c b66c 0000 13bd 7fff ffff
0716140  000b 8530 0200 0db5 0300 5355 0200 61bd 0200 0ad5 0000 32cf 0000 005b 0100 61bd 0200 0ad5 0000 6317 0000 001b 0000 8b3f
0716220  0000 8b47 0000 315f 0000 004c 000b 84e4 b27c b66c 0000 13be 7fff ffff 000b 857c 0200 0db5 0300 5355 0200 61bd 0200 0ad5
0716300  0000 32cf 0000 0053 0100 61bd 0200 0ad5 0000 6317 0000 001b 0000 8b4f 0000 8b47 0000 315f 0000 004c 000b 8530 b27c b66c
0716360  0000 13bf 7fff ffff 000b 85c8 0200 0db5 0300 5355 0200 61bd 0200 0ad5 0000 32cf 0000 004b 0100 61bd 0200 0ad5 0000 6317
0716440  0000 001b 0000 8b57 0000 8b37 0000 315f 0000 004c 000b 857c b27c b66c 0000 13c0 7fff ffff 000b 8614 0200 0db5 0300 5355
```

```
0716520  0200 61bd 0200 0ad5 0000 32cf 0000 0043 0100 61bd 0200 0ad5 0000 6317 0000 001b 0000 8b5f 0000 8b47 0000 315f 0000 004c
0716600  000b 85c8 b27c b66c 0000 13c1 7fff ffff 000b 8660 0200 0db5 0300 5355 0200 61bd 0200 0ad5 0000 32cf 0000 003b 0100 61bd
0716660  0200 0ad5 0000 6317 0000 001b 0000 8b67 0000 8b37 0000 315f 0000 004c 000b 8614 b27c b66c 0000 13c2 7fff ffff 000b 86ac
0716740  0200 0db5 0300 5355 0200 61bd 0200 0ad5 0000 32cf 0000 0033 0100 61bd 0200 0ad5 0000 6317 0000 001b 0000 4bff 0000 8b6f
0717020  0000 315f 0000 004c 000b 8660 b27c b66c 0000 13c3 7fff ffff 000b 86f8 0200 0db5 0300 5355 0200 61bd 0200 0ad5 0000 32cf
0717100  0000 002b 0100 61bd 0200 0ad5 0000 6317 0000 001b 0000 8b77 0000 8a0f 0000 315f 0000 004c 000b 86ac b27c b66c 0000 13c4
0717160  7fff ffff 000b 8744 0200 0db5 0300 5355 0200 61bd 0200 0ad5 0000 32cf 0000 0023 0100 61bd 0200 0ad5 0000 6317 0000 001b
0717240  0000 8ab7 0000 89ff 0000 315f 0000 004c 000b 86f8 b27c b66c 0000 13c5 7fff ffff 000b 8790 0200 0db5 0300 5355 0200 61bd
0717320  0200 0ad5 0000 32cf 0000 001b 0100 61bd 0200 0ad5 0000 6317 0000 001b 0000 5567 0000 89ef 0000 315f 0000 004c 000b 8744
0717400  b27c b66c 0000 13c6 7fff ffff 000b 8b7c 0200 0db5 0300 5355 0200 61bd 0200 0ad5 0000 32cf 0000 0013 0100 61bd 0200 0ad5
0717460  0000 6317 0000 001b 0000 88bf 0000 8a07 0000 315f 000b 8bc4 0000 0034 0000 3977 000b 87d6 0200 3977 0000 0e3f 0000 0daf
0717540  0000 0abf 000b 8726 0000 0ab7 000b 8842 0300 32bf 0300 0ab7 0000 3acf b328 22a4 000b 22a8 0000 0000 0000 3acf b328 af5d
0717620  000b 232c 0000 0000 0000 3a8f b328 8830 000b 2398 0000 0000 0008 da2c 0300 1d17 0000 3a8f 0000 000c 000b 89fc 000b 89fc
0717700  0001 004a 0000 0000 0000 1d17 b464 8852 000b 23c4 000d 2380 0004 706f 7274 0000 0003 6f75 7400 0000 0008 d3ac 0200 3ad7
0717760  0000 3a8f 0000 0008 000b 8a5c 000b 8a98 0001 004a 0000 0000 0000 3ad7 b328 004f 000b 23f8 0000 0000 0004 6874 6162 0000
0720040  0002 3c3e 0000 0000 ffff ffff 0200 3adf 0000 3a8f 0000 0008 000b 8ac4 000b 8b00 0001 004a 0000 0000 0000 3adf b328 315f
0720120  000b 242c 0000 0000 0008 d3cc 0200 3ae7 0000 3a8f 0000 0008 000b 8b4c 000b 8b4c 0001 004a 0000 0000 0000 3ae7 b328 890c
0720200  000b 2460 0000 0000 0011 b574 000a 32fc 001d 2240 2823 2939 302f 3031 2f30 3320 6261 7369 6373 2e70 6c09 3336 2e31 2200
0720260  000b 4144 0100 2def 0000 3a8f 0000 0004 000b 89a8 000b 89a8 0001 004a 0000 0000 0000 3b17 b328 0010 000a d244 0000 0000
0720340  0000 0028 000b 417c b27c b66c 0000 00bd 7fff ffff 000b ada8 0200 0db5 0100 32b5 0000 3a8f 0000 315f 0000 3a8f b328 0abf
0720420  000b 897c 0000 0000 2cac 0e4f 0002 438a 2ca0 89b6 0000 0000 0000 0001 000b 45d0 000b 45d0 0002 438a 000b 89cc 000b 45dc
0720500  0015 7769 7468 5f69 6e70 7574 5f66 726f 6d5f 6368 6172 7300 27f0 0014 000b 8a20 4e1c 0000 0000 0007 4960 228c 2cac 2327
0720560  0002 438a 2ca0 0abf 0000 0000 0000 0001 000b 89e8 000b 8a20 000b 8a2a 000b 1cf8 2954 0014 0002 438a 56f8 76b0 239c 0000
0720640  000b 8848 000d 7465 726d 5f74 6f5f 6368 6172 7300 0000 3fd7 b328 0010 000a ff24 0000 0000 000b 8b1c 000a 267c 27f0 0010
0720720  000b 8a6c 5758 6b48 5fa0 228c 28c4 0014 000b 8a80 5758 5fa0 55f0 6b48 5fa0 228c 28c4 0018 000b 8a98 5758 5fa0 55f0 5fa0
0721000  55f0 6b48 5fa0 228c 2954 001c 0002 438a 5758 5fa0 55f0 5fa0 55f0 5fa0 6750 22bc 000b 8888 000d 6368 6172 735f 746f 5f74
0721060  6572 6d00 27f0 0010 000b 8ad4 5758 6b48 5fa0 2edc 28c4 0014 000b 8ae8 5758 5fa0 55f0 6b48 5fa0 2edc 28c4 0018 000b 8b00
0721140  5758 5fa0 55f0 5fa0 55f0 6b48 5fa0 2edc 2954 001c 0002 438a 5758 5fa0 55f0 5fa0 55f0 5fa0 6750 22bc 000b 88c8 0000 1d17
0721220  b464 8b26 000b 6890 000b 1e64 ffff ffff 0200 3a9f 0000 3a97 0000 0008 000b ae7c 000b ae7c 0001 004b 0000 0000 2c78 0028
0721300  0002 438a 2520 2e7c ad64 2ba0 0010 0012 24d0 0000 000b 8888 0010 aa18 2e98 c5a8 2c58 723c 0000 004c 000b 8790 b27c b66c
0721360  0000 13c7 7fff ffff 000b 92f0 0200 0db5 0300 5355 0200 61bd 0200 0ad5 0000 32cf 0000 000b 0100 61bd 0200 0ad5 0000 6317
0721440  0000 001b 0000 1c77 0000 89f7 0000 315f 000b 813c 0000 0038 0000 315f 000b 8d3c 0000 002c b288 b66c 0000 010d 7fff ffff
0721520  000b 8ba8 0200 0db5 0100 15ad 0100 33fd 0000 000b 0000 315f 0000 0034 000b 688c b27c b66c 0000 010e 7fff ffff 000b 9108
0721600  0200 0db5 0400 24ad 0000 3a9f 0000 0013 0000 39cf 0000 3a97 0000 315f 002c 2f68 6f6d 652f 6f73 6173 322f 622f 7175 696e
0721660  7475 732f 7077 312e 312f 6c69 6272 6172 792f 6672 6f6d 6f6e 746f 0020 002f 2f68 6f6d 652f 6f73 6173 322f 622f 7175 696e
0721740  7475 732f 7077 312e 312f 6c69 6272 6172 792f 6672 6f6d 6f6e 746f 2e70 6c00 6174 0037 2f68 6f6d 652f 6f73 6173 322f 622f
0722020  7175 696e 7475 732f 6765 6e65 7269 632f 7170 6c69 6232 2e35 2f6c 6962 7261 7279 2f66 726f 6d6f 6e74 6f00 5f74 c03a 2f68
0722100  6f6d 652f 6f73 6173 322f 622f 7175 696e 7475 732f 6765 6e65 7269 632f 7170 6c69 6232 2e35 2f6c 6962 7261 7279 2f66 726f
0722160  6d6f 6e74 6f2e 706c 0074 7075 0000 002c 000a f3a4 b27c b66c 0000 0110 7fff ffff 000a d240 0200 0db5 0200 2f35 0000 3c2f
0722240  0000 0263 0000 315f 000b 8dd4 0000 0058 b288 b66c 0000 010f 7fff ffff 000b 8d14 0200 0db5 0100 15ad 0100 33fd 0000 000b
0722320  0000 315f 000b 8dd4 0000 002c b288 b66c 0000 010f 7fff ffff 000b 8d40 0200 0db5 0100 15ad 0100 33fd 0000 000b 0000 315f
0722400  0000 002c 000b 2000 b27c b66c 0000 0139 7fff ffff 000b 2c60 0200 0db5 0200 224d 0000 3c2f 0000 3aa7 0000 315f 2954 0014
0722460  0002 438a 3640 35c8 3588 22bc 0008 b39c 000b 9348 0000 002c b27c b66c 0000 0112 0000 0138 000a d16d 0200 0db5 0200 270d
0722540  0000 3c2f 0000 3aa7 0000 315f 0000 002c 000a e678 b27c b66c 0000 0114 7fff ffff 000a f828 0200 0db5 0200 284d 0000 3aa7
0722620  0000 3c2f 0000 315f 0000 0034 000a eb30 b27c b66c 0000 0115 7fff ffff 000b 8e64 0200 0db5 0400 242d 0000 3c37 0000 0013
0722700  0000 3aa7 0000 21cf 0000 315f 0000 0034 000b 8e30 b27c b66c 0000 0116 7fff ffff 000b 8e98 0200 0db5 0400 242d 0000 3aaf
0722760  0000 0013 0000 3aa7 0000 21cf 0000 315f 0000 0034 000b 8e64 b27c b66c 0000 0117 7fff ffff 000b 8ecc 0200 0db5 0400 242d
0723040  0000 3c3f 0000 0013 0000 3aa7 0000 21cf 0000 315f 0000 0034 000b 8e98 b27c b66c 0000 0118 7fff ffff 000b 8f00 0200 0db5
0723120  0400 242d 0000 3c47 0000 0013 0000 3aa7 0000 21cf 0000 315f 0000 0034 000b 8ecc b27c b66c 0000 0119 7fff ffff 000b 8f34
0723200  0200 0db5 0400 242d 0000 3c4f 0000 0013 0000 3aa7 0000 21cf 0000 315f 0000 0034 000b 8f00 b27c b66c 0000 011a 7fff ffff
0723260  000b 8f68 0200 0db5 0400 242d 0000 3c57 0000 0013 0000 3aa7 0000 21cf 0000 315f 0000 0034 000b 8f34 b27c b66c 0000 011b
0723340  7fff ffff 000b 8f9c 0200 0db5 0400 242d 0000 3c5f 0000 0003 0000 3aa7 0000 21cf 0000 315f 0000 0034 000b 8f68 b27c b66c
0723420  0000 011c 7fff ffff 000a f854 0200 0db5 0400 242d 0000 3c67 0000 000b 0000 3aa7 0000 21cf 0000 315f 0000 0034 000a ecbc
0723500  b27c b66c 0000 011d 7fff ffff 000b 9004 0200 0db5 0200 2855 0200 3c35 0000 0003 0000 0ab7 0000 3aa7 0000 315f 0000 0034
0723560  000b 8fd0 b27c b66c 0000 011e 7fff ffff 000b 9038 0200 0db5 0200 2855 0200 3aad 0000 0003 0000 0e3f 0000 3aa7 0000 315f
```

```
0723640 0000 0034 000b 9004 b27c b66c 0000 011f 7fff ffff 000b 906c 0200 0db5 0200 2855 0200 3c3d 0000 0003 0000 0ab7 0000 3aa7
0723720 0000 315f 0000 0034 000b 9038 b27c b66c 0000 0120 7fff ffff 000b 90a0 0200 0db5 0200 2855 0200 3c45 0000 0003 0000 0ab7
0724000 0000 3aa7 0000 315f 0000 0034 000b 906c b27c b66c 0000 0121 7fff ffff 000b 90d4 0200 0db5 0200 2855 0200 3c4d 0000 0003
0724060 0000 0ab7 0000 3aa7 0000 315f 0000 0034 000b 90a0 b27c b66c 0000 0122 7fff ffff 000d 85bc 0200 0db5 0200 2855 0200 3c55
0724140 0000 0003 0000 0ab7 0000 3aa7 0000 315f 0000 0034 000b 8c00 b27c b66c 0000 0123 7fff ffff 000b 913c 0200 0db5 0400 24ad
0724220 0000 3b2f 0000 0013 0000 3aa7 0000 3a97 0000 315f 0000 0034 000b 9108 b27c b66c 0000 0124 7fff ffff 000b b444 0200 0db5
0724300 0400 24ad 0000 3b37 0000 0013 0000 3aa7 0000 3a97 0000 315f 0000 0030 000a e4f8 b27c b66c 0000 0125 7fff ffff 000b 91a0
0724360 0200 0db5 0300 32bd 0000 3c37 0000 1903 0000 33e7 0000 315f 0000 0030 000b 9170 b27c b66c 0000 0126 7fff ffff 000b 91d0
0724440 0200 0db5 0300 32bd 0000 3aaf 0000 1903 0000 33e7 0000 315f 0000 0030 000b 91a0 b27c b66c 0000 0127 7fff ffff 000b 9200
0724520 0200 0db5 0300 32bd 0000 3c3f 0000 1903 0000 33e7 0000 315f 0000 0030 000b 91d0 b27c b66c 0000 0128 7fff ffff 000b 9230
0724600 0200 0db5 0300 32bd 0000 3c47 0000 1903 0000 33e7 0000 315f 0000 0030 000b 9200 b27c b66c 0000 0129 7fff ffff 000b 9260
0724660 0200 0db5 0300 32bd 0000 3c4f 0000 1903 0000 33e7 0000 315f 0000 0030 000b 9230 b27c b66c 0000 012a 7fff ffff 000b 9290
0724740 0200 0db5 0300 32bd 0000 3c57 0000 1903 0000 33e7 0000 315f 0000 0030 000b 9260 b27c b66c 0000 012b 7fff ffff 000b 92c0
0725020 0200 0db5 0300 32bd 0000 3b2f 0000 1903 0000 33e7 0000 315f 0000 0030 000b 9290 b27c b66c 0000 012c 7fff ffff 0007 9495
0725100 0200 0db5 0300 32bd 0000 3b37 0000 1903 0000 33e7 0000 315f 0000 005c 000b 8b7c b27c b66c 0000 13c8 7fff ffff 000b 8421
0725160 0200 0db5 0300 5355 0200 61bd 0200 0ad5 0000 6467 0000 000b 0200 61bd 0200 0ad5 0000 2ad7 0000 000b 0100 61bd 0200 0ad5
0725240 0000 6317 0000 002b 0000 64b7 0000 8adf 0000 315f 000b 940c 0000 0040 000b 940c 0000 0038 b27c b66c 0000 012f 0000 013b
0725320 000b 9410 0200 0db5 0500 1cdd 0000 3c3f 0000 0013 0000 3aa7 005e f723 0000 0263 0000 315f 2c78 0094 0002 438a 45e8 001c
0725400 4728 0020 32b8 247c 0008 bafc 0024 33bc 4254 0000 0000 2ccf 3af4 0020 0008 d3dc 0020 39f8 0008 e17c 0020 2e7c ae30 2ba0
0725460 0020 001e 3af4 001c 0008 b67c 001c aa6c 2e98 3280 4e1c 0000 0000 000b 2c88 000e 2c58 3280 4e1c 0000 0000 0003 40f4 0000
0725540 0008 e17c 0014 4778 0008 b95c 0010 aa18 aab4 0000 a484 22a0 000b 94c8 0000 0038 b27c b66c 0000 0130 0000 013c 000b 94cc
0725620 0200 0db5 0500 1cdd 0000 3c47 0000 0013 0000 3aa7 005e f823 0000 0263 0000 315f 2c78 0084 0002 438a 45e8 001c 4728 0020
0725700 32b8 247c 0008 bb9c 0024 33bc 4254 0000 0000 3387 3af4 0020 0008 d3dc 0020 39f8 0008 e19c 0020 2e7c ae30 2ba0 0020 001e
0725760 3af4 001c 0008 b67c 001c aa6c 2e98 3280 4e1c 0000 0000 000b 2c88 000e 2c58 3280 4e1c 0000 0000 0003 40f4 0000 0008 e19c
0726040 0014 4078 0008 b95c 0010 aa18 aab4 0000 a484 22a0 000b 956c 0000 0038 b27c b66c 0000 0131 0000 013d 000b 9570 0200 0db5
0726120 0500 1cdd 0000 3c4f 0000 0013 0000 3aa7 005e f9a3 0000 0263 0000 315f 2c78 006c 0002 438a 45dc 4728 001c 329c 24d0 0000
0726200 0008 bafc 0020 3c9c 0000 001c 0008 e17c 001c 2e7c adec 2ba0 001c 001e 3c48 0000 0008 b67c 0018 aa50 2e98 3280 4e1c 0000
0726260 0000 000b 2c88 000e 2c58 3280 4e1c 0000 0000 0003 40e0 0000 0008 e17c 0010 aa18 aab4 0000 a484 22a0 000b 9610 0000 0038
0726340 b27c b66c 0000 0132 0000 013e 000b 9614 0200 0db5 0500 1cdd 0000 3c57 0000 0013 0000 3aa7 005e faa3 0000 0263 0000 315f
0726420 2c78 006c 0002 438a 45dc 4728 001c 329c 24d0 0000 0008 bb9c 0020 3c9c 0000 001c 0008 e19c 001c 2e7c adec 2ba0 001c 001e
0726500 3c48 0000 0008 b67c 0018 aa50 2e98 3280 4e1c 0000 0000 000b 2c88 000e 2c58 3280 4e1c 0000 0000 0003 40e0 0000 0008 e19c
0726560 0010 aa18 aab4 0000 a484 22a0 000b 96f0 0000 00a8 b27c b66c 0000 0133 0000 013f 000b 964c 0200 0db5 0500 1cdd 0000 3c37
0726640 0000 0013 0000 3aa7 005e f523 0000 0263 0000 315f 000b 9680 0000 0038 b27c b66c 0000 0134 0000 0140 000b 9684 0200 0db5
0726720 0500 1cdd 0000 3aaf 0000 0013 0000 3aa7 005e f623 0000 0263 0000 315f 000b 96f0 0000 0038 b27c b66c 0000 0135 0000 0141
0727000 000b 96f4 0200 0db5 0500 1cdd 0000 3c5f 0000 0003 0000 3aa7 005e fc23 0000 0263 0000 315f 2c78 0036 0002 438a 2520 247c
0727060 0008 dadc 0010 3280 24d0 0000 0008 c23c 0010 aa18 aab4 0000 a424 000e 40cc 0000 0008 d83c 000c c5a8 2eb0 6f27 000b b340
0727140 0000 1490 b130 b66c 0000 0136 0000 0142 000b 9329 0200 0db5 0500 1cdd 0000 3c67 0000 000b 0000 3aa7 005e fda3 0000 0263
0727220 0000 315f 000b 9768 0000 0040 0000 0000 0000 0000 0000 0000 0000 000c 0290 000c 0230 000c 01f8 000c 0220 000c 0240 000c 0250
0727300 000c 02b0 000c 02c0 0000 0000 0000 0000 0000 0000 000b b3bc 0000 1418 6f66 2063 6861 7261 6374 6572 2063 6f64 6573 2077
0727360 6869 6368 0a20 2020 206c 6163 6b73 2074 6865 2074 6572 6d69 6e61 6c20 6675 6c6c 2d73 746f 7020 616e 6420 6c61 796f 7574
0727440 2063 6861 7261 6374 6572 7320 6973 206c 696b 656c 7920 746f 2062 650a 2020 2020 7468 6520 636f 6d6d 6f6e 6573 7420 6174
0727520 7465 6d70 7465 6420 7573 6520 6f66 2077 6974 685f 696e 7075 745f 6672 6f6d 5f63 6861 7273 2f32 2c20 7468 6572 6520 6973
0727600 2061 0a20 2020 2070 7265 6469 6361 7465 2063 6861 7273 5f74 6f5f 7465 726d 282b 4368 6172 732c 202d 5465 726d 2920 7768
0727660 6963 6820 646f 6573 2074 6869 732c 2065 2e67 2e0a 2020 2020 6368 6172 735f 746f 5f74 6572 6d28 2266 7265 6422 2c20 5829
0727740 2075 6e69 6669 6573 2058 2077 6974 6820 2766 7265 6427 2e0a 2020 2020 7465 726d 5f74 6f5f 6368 6172 7328 2b54 6572 6d2c
0730020 202d 4368 6172 7329 2069 7320 7468 6520 636f 6e76 6572 7365 206f 6620 6368 6172 735f 746f 5f74 6572 6d2f 322e 0a0a 2020
0730100 2020 4572 726f 7220 6465 7465 6374 696e 6720 616e 6420 7265 706f 7274 696e 6720 696e 2074 6869 7320 6973 2070 7265 7474
0730160 7920 7061 7468 6574 6963 2e20 2053 6f72 7279 2e0a 2a2f 0a0a 3a2d 206d 6f64 756c 6528 6368 6172 7369 6f2c 205b 0a09 6368
0730240 6172 735f 746f 5f73 7472 6561 6d2f 322c 0a09 6368 6172 735f 746f 5f74 6572 6d2f 322c 0a09 7465 726d 5f74 6f5f 6368 6172
0730320 732f 322c 0a09 7769 7468 5f69 6e70 7574 5f66 726f 6d5f 6368 6172 732f 322c 0a09 7769 7468 5f69 6e70 7574 5f66 726f 6d5f
0730400 6368 6172 732f 332c 0a09 7769 7468 5f6f 7574 7075 745f 746f 5f63 6861 7273 2f33 2c0a 0977 6974 685f 6f75 7470 7574 5f74
0730460 6f5f 6368 6172 732f 320a 2020 205d 292e 0a3a 2d20 6d65 7461 5f70 7265 6469 6361 7465 0a09 7769 7468 5f69 6e70 7574 5f66
0730540 726f 6d5f 6368 6172 7328 302c 202b 292c 0a09 7769 7468 5f69 6e70 7574 5f66 726f 6d5f 6368 6172 7328 302c 202d 2c20 2b29
0730620 2c0a 0977 6974 685f 6f75 7470 7574 5f74 6f5f 6368 6172 7328 302c 203f 292c 0a09 7769 7468 5f6f 7574 7075 745f 746f 5f63
0730700 6861 7273 2830 2c20 2d2c 203f 292e 0a0a 7363 6373 5f69 6428 2722 4028 2329 3839 2f30 372f 3137 2063 6861 7273 696f 2e70
```

| | | | | | | | | | | | | | | | | | | | | | | | | |
|---|---|---|---|---|---|---|---|---|---|---|---|---|---|---|---|---|---|---|---|---|---|---|---|---|
| 0730760 | 6c09 | 3333 | 2e31 | 2227 | 292e | 0a0a | 0a25 | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d |
| 0731040 | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d0a | 0a25 | 2020 | 2077 | 6974 | 685f |
| 0731120 | 696e | 7075 | 745f | 6672 | 6f6d | 5f63 | 6861 | 7273 | 282b | 476f | 616c | 2c20 | 2d53 | 7472 | 6561 | 6d2c | 202b | 4368 | 6172 | 7329 | 0a25 | 2020 | 2065 | 7865 |
| 0731200 | 6375 | 7465 | 7320 | 476f | 616c | 2077 | 6974 | 6820 | 5374 | 7265 | 616d | 2062 | 6f75 | 6e64 | 2074 | 6f20 | 616e | 2069 | 6e70 | 7574 | 2073 | 7472 | 6561 | 6d20 |
| 0731260 | 636f | 6e73 | 6973 | 7469 | 6e67 | 206f | 660a | 2520 | 2020 | 7468 | 6520 | 6368 | 6172 | 6163 | 7465 | 7273 | 2069 | 6e20 | 4368 | 6172 | 732c | 2077 | 6869 | 6368 |
| 0731340 | 206d | 7573 | 7420 | 6265 | 2061 | 2067 | 726f | 756e | 6420 | 6c69 | 7374 | 206f | 6620 | 6368 | 6172 | 6163 | 7465 | 7273 | 2e0a | 2520 | 2020 | 5374 | 7265 | 616d |
| 0731420 | 2069 | 7320 | 6d61 | 6465 | 2074 | 6865 | 2063 | 7572 | 7265 | 6e74 | 2069 | 6e70 | 7574 | 2073 | 7472 | 6561 | 6d20 | 7768 | 696c | 6520 | 476f | 616c | 2069 | 7320 |
| 0731500 | 7275 | 6e6e | 696e | 672e | 0a25 | 2020 | 204e | 6f74 | 6520 | 7468 | 6520 | 7065 | 6375 | 6c69 | 6172 | 2075 | 7365 | 206f | 6620 | 5374 | 7265 | 616d | 3a20 | 6974 |
| 0731560 | 2069 | 7320 | 4e4f | 5420 | 666f | 7220 | 636f | 6d6d | 756e | 6963 | 6174 | 696e | 6720 | 610a | 2520 | 2020 | 7661 | 6c75 | 6520 | 746f | 2077 | 6974 | 685f | 696e |
| 0731640 | 7075 | 745f | 6672 | 6f6d | 5f63 | 6861 | 7273 | 2773 | 2063 | 616c | 6c65 | 7220 | 6e6f | 7220 | 666f | 7220 | 7265 | 6365 | 6976 | 696e | 6720 | 6f6e | 652c | 0a25 |
| 0731720 | 2020 | 2062 | 7574 | 2066 | 6f72 | 2070 | 6173 | 7369 | 6e67 | 2061 | 2076 | 616c | 7565 | 2074 | 6f20 | 476f | 616c | 2028 | 4a65 | 6e73 | 656e | 2773 | 2064 | 6576 |
| 0732000 | 6963 | 652c | 206f | 7220 | 6e65 | 6172 | 6c79 | 292e | 0a25 | 2020 | 2054 | 6869 | 7320 | 726f | 7574 | 696e | 6520 | 6973 | 2064 | 6574 | 6572 | 6d69 | 6e61 | 7465 |
| 0732060 | 2c20 | 6275 | 7420 | 7769 | 6c6c | 2066 | 6169 | 6c20 | 6966 | 2047 | 6f61 | 6c20 | 6661 | 696c | 732e | 0a0a | 7769 | 7468 | 5f69 | 6e70 | 7574 | 5f66 | 726f | 6d5f |
| 0732140 | 6368 | 6172 | 7328 | 476f | 616c | 2c20 | 5374 | 7265 | 616d | 2c20 | 4368 | 6172 | 7329 | 203a | 2d0a | 0963 | 6861 | 7273 | 5f74 | 6f5f | 7374 | 7265 | 616d | 2843 |
| 0732220 | 6861 | 7273 | 2c20 | 5374 | 7265 | 616d | 292c | 0a09 | 6375 | 7272 | 656e | 745f | 696e | 7075 | 7428 | 4f6c | 6453 | 7472 | 6561 | 6d29 | 2c0a | 0973 | 6574 | 5f69 |
| 0732300 | 6e70 | 7574 | 2853 | 7472 | 6561 | 6d29 | 2c0a | 0928 | 2020 | 2063 | 616c | 6c28 | 476f | 616c | 2920 | 2d3e | 2046 | 6c61 | 6720 | 3d20 | 3120 | 203b | 2020 | 466c |
| 0732360 | 6167 | 203d | 2030 | 2020 | 2029 | 2c0a | 0973 | 6574 | 5f69 | 6e70 | 7574 | 284f | 6c64 | 5374 | 7265 | 616d | 292c | 0a09 | 636c | 6f73 | 6528 | 5374 | 7265 | 616d |
| 0732440 | 292c | 0a09 | 466c | 6167 | 203d | 3a3d | 2031 | 2c0a | 0a25 | 2020 | 2077 | 6974 | 685f | 696e | 7075 | 745f | 6672 | 6f6d | 5f63 | 6861 | 7273 | 282b | 476f | 616c |
| 0732520 | 2c20 | 2b43 | 6861 | 7273 | 290a | 2520 | 2020 | 6973 | 2066 | 6f72 | 2074 | 6865 | 2063 | 6f6d | 6d6f | 6e20 | 6361 | 7365 | 2077 | 6865 | 7265 | 2047 | 6f61 | 6c20 |
| 0732600 | 7573 | 6573 | 2074 | 6865 | 2063 | 7572 | 7265 | 6e74 | 2069 | 6e70 | 7574 | 2073 | 7472 | 6561 | 6d0a | 2520 | 2020 | 616e | 6420 | 646f | 6573 | 6e27 | 7420 | 6e65 |
| 0732660 | 6564 | 2074 | 6865 | 2053 | 7472 | 6561 | 6d20 | 7061 | 7261 | 6d65 | 7465 | 722e | 0a0a | 7769 | 7468 | 5f69 | 6e70 | 7574 | 5f66 | 726f | 6d5f | 6368 | 6172 | 7328 |
| 0732740 | 476f | 616c | 2c20 | 4368 | 6172 | 7329 | 203a | 2d0a | 0963 | 6861 | 7273 | 5f74 | 6f5f | 7374 | 7265 | 616d | 2843 | 6861 | 7273 | 2c20 | 5374 | 7265 | 616d | 292c |
| 0733020 | 0a09 | 6375 | 7272 | 656e | 745f | 696e | 7075 | 7428 | 4f6c | 6453 | 7472 | 6561 | 6d29 | 2c0a | 0973 | 6574 | 5f69 | 6e70 | 7574 | 2853 | 7472 | 6561 | 6d29 | 2c0a |
| 0733100 | 0928 | 2020 | 2063 | 616c | 6c28 | 476f | 616c | 2920 | 2d3e | 2046 | 6c61 | 6720 | 3d20 | 3120 | 203b | 2020 | 466c | 6167 | 203d | 2030 | 2020 | 2029 | 2c0a | 0973 |
| 0733160 | 6574 | 5f69 | 6e70 | 7574 | 284f | 6c64 | 5374 | 7265 | 616d | 292c | 0a09 | 636c | 6f73 | 6528 | 5374 | 7265 | 616d | 292c | 0a09 | 466c | 6167 | 203d | 3a3d | 2031 |
| 0733240 | 2e0a | 0a0a | 2520 | 2020 | 6368 | 6172 | 735f | 746f | 5f74 | 6572 | 6d28 | 2b43 | 6861 | 7273 | 2c20 | 3f54 | 6572 | 6d29 | 0a25 | 2020 | 2074 | 616b | 6573 | 2061 |
| 0733320 | 206c | 6973 | 7420 | 6f66 | 2063 | 6861 | 7261 | 6374 | 6572 | 7320 | 7375 | 6368 | 2061 | 7320 | 2266 | 2861 | 2c62 | 2922 | 2c20 | 6c61 | 636b | 696e | 6720 | 6120 |
| 0733400 | 7465 | 726d | 696e | 616c | 0a25 | 2020 | 2066 | 756c | 6c20 | 7374 | 6f70 | 2061 | 6e64 | 206c | 6179 | 6f75 | 7420 | 6368 | 6172 | 6163 | 7465 | 722c | 2061 | 6e64 |
| 0733460 | 2072 | 6561 | 6473 | 2061 | 2074 | 6572 | 6d20 | 6672 | 6f6d | 2069 | 742c | 2073 | 7563 | 680a | 2520 | 2020 | 6173 | 2066 | 2861 | 2c62 | 292e | 2020 | 4974 | 2066 |
| 0733540 | 6169 | 6c73 | 2069 | 6620 | 7468 | 6572 | 6520 | 6973 | 2061 | 6e79 | 7468 | 696e | 6720 | 6c65 | 6674 | 206f | 7665 | 722e | 0a0a | 6368 | 6172 | 735f | 746f | 5f74 |
| 0733620 | 6572 | 6d28 | 4368 | 6172 | 732c | 2054 | 6572 | 6d29 | 203a | 2d0a | 0963 | 6861 | 7273 | 5f74 | 6f5f | 7374 | 7265 | 616d | 2843 | 6861 | 7273 | 2c20 | 332c | 2053 |
| 0733700 | 7472 | 6561 | 6d29 | 2c0a | 0963 | 7572 | 7265 | 6e74 | 5f69 | 6e70 | 7574 | 284f | 6c64 | 5374 | 7265 | 616d | 292c | 0a09 | 7365 | 745f | 696e | 7075 | 7428 | 5374 |
| 0733760 | 7265 | 616d | 292c | 0a09 | 2820 | 2020 | 7265 | 6164 | 2859 | 292c | 2067 | 6574 | 3028 | 2d31 | 2920 | 2d3e | 2046 | 6c61 | 6720 | 3d20 | 3120 | 3b20 | 466c | 6167 |
| 0734040 | 203d | 2030 | 2020 | 2029 | 2c0a | 0973 | 6574 | 5f69 | 6e70 | 7574 | 284f | 6c64 | 5374 | 7265 | 616d | 292c | 0a09 | 636c | 6f73 | 6528 | 5374 | 7265 | 616d | 292c |
| 0734120 | 0a09 | 466c | 6167 | 203d | 3a3d | 2031 | 2c0a | 0954 | 6572 | 6d20 | 3d20 | 582e | 0a0a | 2520 | 2020 | 6368 | 6172 | 735f | 746f | 5f73 | 7472 | 6561 | 6d28 | 2b43 |
| 0734200 | 6861 | 7273 | 2c20 | 2d53 | 7472 | 6561 | 6d29 | 0a25 | 2020 | 2063 | 7265 | 6174 | 6573 | 2061 | 206e | 6577 | 2069 | 6e70 | 7574 | 2073 | 7472 | 6561 | 6d20 | 5374 |
| 0734260 | 7265 | 616d | 2c20 | 7468 | 6520 | 6368 | 6172 | 6163 | 7465 | 7273 | 206f | 6620 | 7768 | 6963 | 6820 | 6172 | 650a | 2520 | 2020 | 7468 | 6520 | 656c | 656d | 656e |
| 0734340 | 7473 | 206f | 6620 | 4368 | 6172 | 732c | 2077 | 6869 | 6368 | 206d | 7573 | 7420 | 6265 | 2061 | 206c | 6973 | 7420 | 6f66 | 2063 | 6861 | 7261 | 6374 | 6572 | 2063 |
| 0734420 | 6f64 | 6573 | 2e0a | 2520 | 2020 | 4e6f | 7465 | 2074 | 6861 | 7420 | 6120 | 636f | 7079 | 206f | 6620 | 7468 | 6573 | 6520 | 6368 | 6172 | 6163 | 7465 | 7273 | 2069 |
| 0734500 | 7320 | 6d61 | 6465 | 3a20 | 6974 | 2069 | 7320 | 7065 | 7266 | 6563 | 746c | 790a | 2520 | 2020 | 706f | 7373 | 6962 | 6c65 | 2066 | 6f72 | 2074 | 6865 | 2053 | 7472 |
| 0734560 | 6561 | 6d20 | 6861 | 6e64 | 6c65 | 2074 | 6f20 | 6265 | 2073 | 746f | 7265 | 6420 | 696e | 2074 | 6865 | 2064 | 6174 | 6120 | 6261 | 7365 | 2c0a | 2520 | 2020 | 616e |
| 0734640 | 6420 | 7265 | 7472 | 6965 | 7665 | 6420 | 616e | 6420 | 7573 | 6564 | 2073 | 6166 | 656c | 7920 | 6174 | 2061 | 2074 | 696d | 6520 | 7768 | 656e | 2062 | 6163 | 6b74 |
| 0734720 | 7261 | 636b | 696e | 6720 | 6861 | 730a | 2520 | 2020 | 636f | 6d70 | 6c65 | 7465 | 6c79 | 2064 | 6973 | 736f | 6c76 | 6564 | 2043 | 6861 | 7273 | 2e20 | 2054 | 6869 |
| 0735000 | 7320 | 6973 | 2077 | 6879 | 2043 | 6861 | 7273 | 206d | 7573 | 7420 | 6265 | 2067 | 726f | 756e | 642e | 0a0a | 6368 | 6172 | 735f | 746f | 5f73 | 7472 | 6561 | 6d28 |
| 0735060 | 4368 | 6172 | 732c | 2053 | 7472 | 6561 | 6d29 | 203a | 2d0a | 0963 | 6861 | 7273 | 5f74 | 6f5f | 7374 | 7265 | 616d | 2843 | 6861 | 7273 | 2c20 | 302c | 2053 | 7472 |
| 0735140 | 6561 | 6d29 | 2e0a | 0a0a | 6368 | 6172 | 735f | 746f | 5f73 | 7472 | 6561 | 6d28 | 4368 | 6172 | 732c | 2044 | 6f74 | 702c | 2053 | 7472 | 6561 | 6d29 | 203a | 2d0a |
| 0735220 | 0963 | 6861 | 7273 | 2843 | 6861 | 7273 | 2c20 | 302c | 204c | 656e | 6774 | 6829 | 2c09 | 0925 | 2063 | 6865 | 636b | 2043 | 6861 | 7273 | 2c20 | 6669 | 6e64 | 204c |
| 0735300 | 656e | 6774 | 680a | 0921 | 2c0a | 096e | 6577 | 5f62 | 7974 | 655f | 7665 | 6374 | 6f72 | 284c | 656e | 6774 | 682c | 2044 | 6f74 | 702c | 2056 | 6563 | 746f | 7229 |
| 0735360 | 2c09 | 2520 | 6d61 | 6b65 | 2061 | 2062 | 7974 | 6520 | 5665 | 6374 | 6f72 | 0a09 | 5665 | 6374 | 6f72 | 203d | 5c3d | 2030 | 2c09 | 0909 | 0925 | 2069 | 7420 | 7761 |
| 0735440 | 7320 | 6d61 | 6465 | 0a09 | 6368 | 6172 | 735f | 746f | 5f62 | 7974 | 655f | 7665 | 6374 | 6f72 | 2843 | 6861 | 7273 | 2c20 | 5665 | 6374 | 6f72 | 2c20 | 4c65 | 6e67 |
| 0735520 | 7468 | 292c | 0925 | 2066 | 696c | 6c20 | 6974 | 0a09 | 446f | 7474 | 6564 | 4c65 | 6e67 | 7468 | 2069 | 7320 | 4c65 | 6e67 | 7468 | 2b44 | 6f74 | 702c | 0a09 | 7374 |
| 0735600 | 7265 | 616d | 5f66 | 726f | 6d5f | 6279 | 7465 | 5f76 | 6563 | 746f | 7228 | 5665 | 6374 | 6f72 | 2c20 | 446f | 7474 | 6564 | 4c65 | 6e67 | 7468 | 2c20 | 5374 | 7265 |
| 0735660 | 616d | 436f | 6465 | 2c20 | 3129 | 2c0a | 0973 | 7472 | 6561 | 6d5f | 636f | 6465 | 2853 | 7472 | 6561 | 6d2c | 2053 | 7472 | 6561 | 6d43 | 6f64 | 6529 | 2e0a | 6368 |
| 0735740 | 6172 | 735f | 746f | 5f73 | 7472 | 6561 | 6d28 | 4368 | 6172 | 732c | 205f | 2c20 | 5f29 | 203a | 2d0a | 0966 | 6f72 | 6d61 | 7428 | 7573 | 6572 | 5f65 | 7272 | 6f72 |
| 0736020 | 2c0a | 0920 | 2020 | 2027 | 7e4e | 2120 | 6368 | 6172 | 735f | 746f | 5f73 | 7472 | 6561 | 6d2f | 323a | 2062 | 6164 | 2043 | 6861 | 7273 | 2061 | 7267 | 756d | 656e |

```
0736100  7420 7e77 7e6e 272c 0a09 2020 2020 5b43 6861 7273 5d29 2c0a 0966 6169 6c2e 0a0a 0a25 2520 2063 6861 7273 282b 4368 6172
0736160  732c 202b 4c30 2c20 2d4c 290a 2520 2020 7375 6363 6565 6473 2077 6865 6e20 4368 6172 7320 6973 2061 2070 726f 7065 7220
0736240  6c69 7374 206f 6620 6368 6172 6163 7465 7220 636f 6465 732c 0a25 2020 2061 6e64 204c 2d4c 3020 6973 2069 7473 206c 656e
0736320  6774 682e 0a0a 6368 6172 7328 212c 205f 2c20 5f29 203a 2d20 212c 2066 6169 6c2e 0a63 6861 7273 285b 5d2c 204c 2c20 4c29
0736400  2e0a 6368 6172 7328 5b43 6861 727c 4368 6172 735d 2c20 4c30 2c20 4c29 203a 2d0a 0969 6e74 6567 6572 2843 6861 7229 2c20
0736460  3020 3d3c 2043 6861 722c 2043 6861 7220 3d3c 2032 3535 2c0a 094c 3120 6973 204c 302b 312c 0a09 6368 6172 7328 4368 6172
0736540  732c 204c 312c 204c 292e 0a0a 0a25 2020 2053 746f 7265 2074 6865 2063 6861 7261 6374 6572 7320 6f66 2043 6861 7273 2069
0736620  6e74 6f20 7468 6520 6279 7465 2076 6563 746f 7220 5665 6374 6f72 2e0a 2520 2020 5468 6520 6375 7272 656e 7420 6c65 6e67
0736700  7468 204c 656e 6774 6820 6973 2063 6865 636b 6564 2066 6f72 206f 7665 7266 6c6f 772e 0a0a 6368 6172 735f 746f 5f62 7974
0736760  655f 7665 6374 6f72 285b 5d2c 205f 2c20 5f29 2e0a 6368 6172 735f 746f 5f62 7974 655f 7665 6374 6f72 285b 4368 6172 7c43
0737040  6861 7273 5d2c 2056 6563 746f 722c 204c 656e 6774 6829 203a 2d0a 094c 656e 6774 6820 3e20 302c 0a09 7374 6f72 655f 6279
0737120  7465 2843 6861 722c 2056 6563 746f 722c 204e 6578 7429 2c0a 094c 6566 7420 6973 204c 656e 6774 682d 312c 0a09 6368 6172
0737200  735f 746f 5f62 7974 655f 7665 6374 6f72 2843 6861 7273 2c20 4e65 7874 2c20 4c65 6674 292e 0a0a 0a0a 252d 2d2d 2d2d 2d2d
0737260  2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d
0737340  2d2d 2d2d 2d2d 2d2d 2d2d 2d2d 2d2d 2d2d 0a0a 2520 2020 7769 7468 5f6f 7574 7075 745f 746f 5f63 6861 7273 282b 476f 616c
0737420  2c20 2d53 7472 6561 6d2c 203f 4368 6172 7329 0a25 2020 2065 7865 6375 7465 7320 476f 616c 2077 6974 6820 5374 7265 616d
0737500  2062 6f75 6e64 2074 6f20 6120 6e65 7720 6f75 7470 7574 2073 7472 6561 6d2c 2077 6869 6368 2069 7320 616c 736f 0a25 2020
0737560  206d 6164 6520 7468 6520 6375 7272 656e 7420 6f75 7470 7574 2073 7472 6561 6d20 7768 6963 6820 476f 616c 2069 7320 7275
0737640  6e6e 696e 672e 2020 4166 7465 7220 7468 6520 476f 616c 0a25 2020 2073 7563 6365 6564 732c 2074 6865 2063 6861 7261 6374
0737720  6572 7320 7768 6963 6820 7765 7265 2077 7269 7474 656e 2074 6f20 5374 7265 616d 2061 7265 2066 6f72 6d65 6420 696e 746f
0740000  0a25 2020 2061 206c 6973 742c 2061 6e64 2074 6865 2072 6573 756c 7420 756e 6966 6965 6420 7769 7468 2043 6861 7273 2e0a
0740060  2520 2020 4e6f 7465 2074 6865 2070 6563 756c 6961 7220 7573 6520 6f66 2053 7472 6561 6d3a 2069 7420 6973 204e 4f54 2066
0740140  6f72 2063 6f6d 6d75 6e69 6361 7469 6e67 2061 0a25 2020 2076 616c 7565 2074 6f20 7769 7468 5f6f 7574 7075 745f 746f 5f63
0740220  6861 7273 2773 2063 616c 6c65 7220 6e6f 7220 666f 7220 7265 6365 6976 696e 6720 6f6e 652c 0a25 2020 2062 7574 2066 6f72
0740300  2070 6173 7369 6e67 2061 2076 616c 7565 2074 6f20 476f 616c 2028 4a65 6e73 656e 2773 2064 6576 6963 652c 206f 7220 6e65
0740360  6172 6c79 292e 0a25 2020 2054 6869 7320 726f 7574 696e 6520 6973 2064 6574 6572 6d69 6e61 7465 2c20 6275 7420 7769 6c6c
0740440  2066 6169 6c20 6966 2047 6f61 6c20 6661 696c 732c 206f 7220 6966 2074 6865 0a25 2020 2073 6571 7565 6e63 6520 6f66 2063
0740520  6961 7261 6374 6572 7320 7772 6974 7465 6e20 746f 2053 7472 6561 6d20 6573 6e27 7420 756e 6966 7920 7769 7468 2043
0740600  6861 7273 2e0a 0a77 6974 685f 6f75 7470 7574 5f74 6f5f 6368 6172 7328 476f 616c 2c20 5374 7265 616d 2c20 4368 6172 7329
0740660  203a 2d0a 0973 7461 7274 5f6f 7574 7075 745f 746f 5f68 616e 646c 6528 4861 6e64 6c65 2c20 5374 7265 616d 292c 0a09 6375
0740740  7272 656e 745f 6f75 7470 7574 284f 6c64 5374 7265 616d 292c 0a09 7365 745f 6f75 7470 7574 2853 7472 6561 6d29 2c0a 0928
0741020  2020 2063 616c 6c28 476f 616c 2920 2d3e 2046 6c61 6720 3d20 3120 203b 2020 466c 6167 203d 2030 2020 2029 2c0a 0973 6574
0741100  5f6f 7574 7075 7428 4f6c 6453 7472 6561 6d29 2c0a 0963 6c6f 7365 2853 7472 6561 6d29 2c0a 0962 7974 655f 7374 7265 616d
0741160  5f74 6f5f 6368 6172 7328 4861 6e64 6c65 2c20 4368 6172 7330 292c 0a09 6672 6565 5f62 7974 655f 7374 7265 616d 2848 616e
0741240  646c 6529 2c09 0925 2074 6869 7320 6861 6420 6265 7474 6572 2062 6520 646f 6e65 210a 0946 6c61 6720 3d20 312c 0a09 4368
0741320  6172 7320 3d20 4368 6172 7330 2e0a 0a0a 2520 2020 7769 7468 5f6f 7574 0014 7769 7468 5f6f 7574 7075 745f 746f 5f63 6861
0741400  7273 0033 000a 4538 0000 0000 000c 4b04 000b ab94 0000 3c4f b328 af5d 000b 8f04 0000 0000 000a 4198 0000 0000 0004 766c
0741460  6578 0000 0000 3a97 b328 abcc 000a e67c 0000 0000 0000 3a9f b328 af5d 000a e6a8 0000 0000 0008 d44c 0200 3b1f 0000 3a97
0741540  0000 0008 000a f0b4 000a f0b4 0001 004b 0000 0000 0000 3b1f b328 315f 000a e9f4 0000 0000 ffff ffff 0200 3b27 0000 3a97
0741620  0000 0008 000b 264c 000b 264c 0001 004b 0000 0000 0000 3b27 b328 27bf 000a ea28 0000 0000 ffff ffff 0200 3b2f 0000 3a97
0741700  0000 0008 000a f000 000a f000 0001 004b 0000 0000 0000 3b2f b464 ac68 000a ea5c 000b 4348 000b ac44 0300 3b2f 0000 3a97
0741760  0000 000c 000a ef4c 000a ef4c 0001 004b 0000 0000 ffff ffff 0300 3b37 0000 3a97 0000 000c 000b 2488 000b 2488 0001 004b
0742040  0000 0000 0000 3b37 b464 acb1 000a eac4 000b 4288 000b ac94 0200 3b37 0000 3a97 0000 0008 000b 256c 000b 256c 0001 004b
0742120  0000 0000 0200 3b2f b328 37ef 000a eb9c 0000 0000 000b ace4 000a eaec 0300 3b2f b328 0007 000a ec04 0000 0000 000b acfc
0742200  000b acf4 0200 3b37 b328 0db7 000a ec9c 0000 0000 0014 9904 000a f32c 000b ad14 0000 0000 0300 3b37 b328 000b 000a ecc0
0742260  0000 0000 000b ad34 000b ad2c 001e 2240 2823 2938 392f 3037 2f31 3720 6368 6172 7369 6f2e 706c 0933 332e 3122 0000 1e7f
0742340  000b 8940 0100 2def 0000 3a97 0000 0004 000b add8 000b add8 0001 004b 0000 0000 0000 3c47 b328 ad9d 000b 8ed0 0000 0000
0742420  0000 0028 000b 8978 b27c b66c 0000 00de 7fff ffff 000c 0198 0200 0db5 0100 32b5 0000 3a97 0000 315f 0000 3a97 b328 add5
0742500  000b adac 0000 0000 2cac 37ef 0002 438a 2ca0 0007 0000 0000 0000 0001 000a e6d0 000a e6d0 0002 438a 000a ebc4 0000 3c3f
0742560  b328 ae06 000b 8e9c 0000 0000 000b b218 000b ae74 000c 1594 0000 0000 0005 696e 7075 7400 0000 3aaf b328 ae2e 000b 8e68
0742640  0000 0000 0000 3c2f b328 ae1d 000b 8d9c 0000 0000 000b 8b2c 0300 3a9f 0000 3a97 0000 000c 000a f1bc 000b af68 0001 004b
0742720  0000 0000 0000 3c37 b328 ae6e 000b 8e34 0000 0000 000a 26ec 0000 0000 2c78 0018 0002 438a 3640 41e8 0000 0003 239c 0000
0743000  000b ae54 000f 6e65 775f 6279 7465 5f76 6563 746f 7200 017b 0014 6368 6172 735f 746f 5f62 7974 655f 7665 6374 6f72 0093
0743060  0017 7374 7265 616d 5f66 726f 645f 6279 7465 5f76 6563 746f 7200 aede 0008 6164 645f 7365 6c66 0000 0008 b8ec 0300 1f77
0743140  0000 3a97 0000 000c 000b afc4 000b afc4 0001 004b 0000 0000 0008 d4ac 0300 3b47 0000 3a97 0000 000c 000b dcb4 000b dcb4
```

```
0743220 0021 0000 0000 0000 0008 d4cc 0300 3b4f 0000 3a97 0000 000c 000b b028 000b b028 0001 004b 0000 0000 0008 d4ec 0400 3b57
0743300 0000 3a97 0000 0010 000b dd6c 000b dd6c 0021 0000 0000 0000 2954 0028 0002 438a 2520 4568 6b48 5370 4254 0000 0000 3b5f
0743360 4300 0000 0000 328f 0008 c11c 000c c5a8 0008 d58c 0300 3b87 0000 3a97 0000 000c 000b dd8c 000b dd8c 0021 0000 0000 0000
0743440 27f0 0014 000b afe8 4e1c 0000 0000 0ad7 3050 c5a8 2cac 037b 0002 438a 2ca0 036b 0000 0004 0000 0002 000b afb0 000b 16ec
0743520 000b 16f6 000b affc 28c4 0014 000b 16ec 4e1c 0000 0000 0007 4960 228c 000b b00d 0000 0000 000b afbc 0000 0000 000b aff4
0743600 000b b004 27f0 0012 000b 171c 4e1c 0000 0000 0007 228c 03b3 2cac b01e 0002 438a 2ca0 b026 0000 0000 0000 0001 000b b014
0743660 000b 171c 000b 1726 000a ee54 000a 7374 6f72 655f 6279 7465 000b b04e ffff ffff 0300 3b67 0000 3a97 0000 000c 000b dd0c
0743740 000b dd0c 0021 0000 0000 0000 0016 7374 6172 745f 6f75 7470 7574 5f74 6f5f 6861 6e64 6c65 0000 039b 0014 6279 7465 5f73
0744020 7472 6561 6d5f 746f 5f63 6861 7273 007b 0010 6672 6565 5f62 7974 655f 7374 7265 616d 00b6 0000 3c2f b328 b0be 000b 8d18
0744100 0000 0000 000a 4188 0000 0000 000a f230 000a 24c0 0008 d52c 0200 3b6f 0000 3a97 0000 0008 000b b188 000b b188 0001 004b
0744160 0000 0000 0008 d56c 0200 3b77 0000 3a97 0000 0008 000b b1f0 000b b1f0 0001 004b 0000 0000 ffff ffff 0100 3b7f 0000 3a97
0744240 0000 0004 000b ddb0 000b ddb0 0021 0000 0000 0300 2b24 de38 0002 438a 000b 48cc 000a 636f 7079 5f62 7974 6573 0000 0000
0744320 0015 7374 7265 616d 5f74 6f5f 6279 7465 5f76 6563 746f 7200 000a 6672 6f6d 5f63 6861 7273 000b b2d8 2c78 0028 0002 438a
0744400 2520 46d8 4268 0000 0000 000b 332c 247c 000b afa0 0014 3d30 2420 0000 0008 e43c 0014 6279 7465 5f73 7472 6561 6d5f 636f
0744460 6e74 656e 7473 000b 0014 6279 7465 5f76 6563 746f 725f 746f 5f63 6861 7273 004b 000b 6f6e 746f 5f73 7472 6561 6d00 0000
0744540 2c78 0028 0002 438a 2520 4700 33bc 3310 24d0 0000 000b b228 0018 386c 3d30 3cf4 242c 0000 000b b248 ffff ffff 0300 3b8f
0744620 0000 3a97 0000 000c 000b dd4c 000b dd4c 0021 0000 0000 0000 0008 d5ac 0300 3b97 0000 3a97 0000 000c 000b 2780 000b 2780
0744700 0001 004b 0000 0000 000a 6665 7463 685f 6279 7465 0000 0383 000b 6672 6f6d 5f73 7472 6561 6d00 0000 ffff ffff 0300 3b9f
0744760 0000 3a97 0000 000c 000b dd2c 000b dd2c 0021 0000 0000 0000 0009 6368 6172 7369 6f2e 6f00 0010 6672 6565 5f62 7974 655f
0745040 7665 6374 6f72 0073 0008 eb6c 0200 221f 0000 3a97 0000 0008 000a 18f0 000a 18f0 0000 0000 0000 0000 0000 3a9f b328 019b
0745120 000b 8c04 0000 0000 0000 0000 0000 0024 2ca0 b2f6 0000 0000 0000 0001 000b 2810 000b 2810 0002 438a 000a ecec 0008 eb4c
0745200 0200 22d7 0000 3a97 0000 0008 000a 18f0 000a 18f0 0000 0000 0000 0000 000a 6368 6172 7369 6f2e 706c 0000 0000 000b b39c
0745260 0000 002c 2ca0 037b 0000 001c 0000 0008 000b 28a4 000b 2b28 0002 438a 000b b398 000b b37c 0000 0008 0000 3b17 b328 290c
0745340 000b 2c64 0000 0000 0000 0000 0000 0008 0012 7374 7275 6374 2062 7974 655f 7374 7265 616d 0000 030b 000b b4a8 0000 00a4
0745420 000b 2a6c 000b 29a4 000b 2940 000b 290c 0000 0000 000b 2b34 000b b4a8 0000 0084 b288 b66c 0000 0143 7fff ffff 000c 0330
0745500 0200 0db5 0100 15ad 0100 33fd 0000 000b 0000 315f 000b b414 0000 002c b288 b66c 0000 0143 7fff ffff 000b b3c0 0200 0db5
0745560 0100 15ad 0100 33fd 0000 000b 0000 315f 000b b528 0000 002c b288 b66c 0000 0143 7fff ffff 000b b3ec 0200 0db5 0100 15ad
0745640 0100 33fd 0000 000b 0000 315f 0000 0034 000b 913c b27c b66c 0000 0144 7fff ffff 000a 262c 0200 0db5 0400 24ad 0000 3aaf
0745720 0000 0013 0000 39cf 0000 3aa7 0000 315f 0000 0034 000a 29c8 b27c b66c 0000 06f1 7fff ffff 0010 6404 0200 0db5 0400 24ad
0746000 0000 3f7f 0000 001b 0000 2c0f 0000 3e17 0000 315f 000b b528 0000 0038 b27c b66c 0000 06f2 0000 06fc 0010 3244 0200 0db5
0746060 0500 1cdd 0000 2def 0000 000b 0000 2c0f 0085 2843 0000 0303 0000 315f 2c78 0012 0002 438a 4e1c 0000 0000 5177 228c 0000
0746140 0000 0034 000a 262c b27c b66c 0000 0147 7fff ffff 000a f084 0200 0db5 0400 24ad 0000 2e1f 0000 001b 0000 39cf 0000 2c27
0746220 0000 315f 000b b9f4 0000 0474 b288 b66c 0000 0145 7fff ffff 000b b4f8 0200 0db5 0100 15ad 0100 33fd 0200 0b3d 0000 261f
0746300 0000 0003 0000 315f 000b b590 0000 0034 b288 b66c 0000 0145 7fff ffff 000b b52c 0200 0db5 0100 15ad 0100 33fd 0200 0b3d
0746360 0000 294f 0000 0013 0000 315f 000b b5c4 0000 0034 b288 b66c 0000 0145 7fff ffff 000b b560 0200 0db5 0100 15ad 0100 33fd
0746440 0200 0b3d 0000 296f 0000 0013 0000 315f 000b b5f8 0000 0034 b288 b66c 0000 0145 7fff ffff 000b b594 0200 0db5 0100 15ad
0746520 0100 33fd 0200 0b3d 0000 2a77 0000 000b 0000 315f 000b b62c 0000 0034 b288 b66c 0000 0145 7fff ffff 000b b5c8 0200 0db5
0746600 0100 15ad 0100 33fd 0200 0b3d 0000 2a77 0000 0013 0000 315f 000b b660 0000 0034 b288 b66c 0000 0145 7fff ffff 000b b5fc
0746660 0200 0db5 0100 15ad 0100 33fd 0200 0b3d 0000 2e1f 0000 0013 0000 315f 000b b694 0000 0034 b288 b66c 0000 0145 7fff ffff
0746740 000b b630 0200 0db5 0100 15ad 0100 33fd 0200 0b3d 0000 2e1f 0000 001b 0000 315f 000b b6c8 0000 0034 b288 b66c 0000 0145
0747020 7fff ffff 000b b564 0200 0db5 0100 15ad 0100 33fd 0200 0b3d 0000 2e67 0000 0013 0000 315f 000b b6fc 0000 0034 b288 b66c
0747100 0000 0145 7fff ffff 000b b698 0200 0db5 0100 15ad 0100 33fd 0200 0b3d 0000 2e67 0000 001b 0000 315f 000b b730 0000 0034
0747160 b288 b66c 0000 0145 7fff ffff 000b b6cc 0200 0db5 0100 15ad 0100 33fd 0200 0b3d 0000 23a7 0000 001b 0000 315f 000b b764
0747240 0000 0034 b288 b66c 0000 0145 7fff ffff 000b b700 0200 0db5 0100 15ad 0100 33fd 0200 0b3d 0000 23df 0000 001b 0000 315f
0747320 000b b798 0000 0034 b288 b66c 0000 0145 7fff ffff 000b b734 0200 0db5 0100 15ad 0100 33fd 0200 0b3d 0000 2cdf 0000 001b
0747400 0000 315f 000b b7cc 0000 0034 b288 b66c 0000 0145 7fff ffff 000b b768 0200 0db5 0100 15ad 0100 33fd 0200 0b3d 0000 23cf
0747460 0000 001b 0000 315f 000b b800 0000 0034 b288 b66c 0000 0145 7fff ffff 000b b79c 0200 0db5 0100 15ad 0100 33fd 0200 0b3d
0747540 0000 23d7 0000 001b 0000 315f 000b b834 0000 0034 b288 b66c 0000 0145 7fff ffff 000b b7d0 0200 0db5 0100 15ad 0100 33fd
0747620 0200 0b3d 0000 1f47 0000 0013 0000 315f 000b b868 0000 0034 b288 b66c 0000 0145 7fff ffff 000b b804 0200 0db5 0100 15ad
0747700 0100 33fd 0200 0b3d 0000 1f4f 0000 0013 0000 315f 000b b89c 0000 0034 b288 b66c 0000 0145 7fff ffff 000b b838 0200 0db5
0747760 0100 15ad 0100 33fd 0200 0b3d 0000 2e37 0000 001b 0000 315f 000b b8d0 0000 0034 b288 b66c 0000 0145 7fff ffff 000b b86c
0750040 0200 0db5 0100 15ad 0100 33fd 0200 0b3d 0000 1e17 0000 0003 0000 315f 000b b904 0000 0034 b288 b66c 0000 0145 7fff ffff
0750120 000b b8a0 0200 0db5 0100 15ad 0100 33fd 0200 0b3d 0000 1ec7 0000 0003 0000 315f 000b b938 0000 0034 b288 b66c 0000 0145
0750200 7fff ffff 000b b8d4 0200 0db5 0100 15ad 0100 33fd 0200 0b3d 0000 312f 0000 0013 0000 315f 000b b970 0000 0038 b27c b66c
0750260 0000 0148 0000 0154 000b b9f8 0200 0db5 0500 1cdd 0000 3a5f 0000 0013 0000 39cf 005b 3683 0000 024b 0000 315f 000b b9f4
```

```
0750340 0000 002c b4f0 b4e4 0000 0147 7fff ffff 0008 b0dd c000 0000 0000 0000 000b bbcc 0002 438a 000c 04c0 2c78 0058 0002 438a
0750420 2520 46d8 3348 247c 0008 ba5c 0018 3228 4254 0000 c000 0003 3bf4 0000 0008 d2fc 0018 332c 44c4 0090 0100 2bcf 6d94 43c0
0750500 0200 0daf 4b8c 000c 0000 39cf 6bf4 247c 000b dec4 0014 3d30 2420 0000 0008 b39c 000b ba64 0000 0038 b27c b66c 0000 014a
0750560 0000 0155 000b ba68 0200 0db5 0500 1cdd 0000 3a67 c000 0013 0000 39cf 005b 3803 0000 024b 0000 315f 2954 0036 0002 438a
0750640 45c4 46d8 3348 39f8 0008 b39c 0018 2ba0 0018 0010 37dc 408c 000c 03c4 0014 2c88 000a 2c58 3788 4a7c 000c 2ecc 723c 6b65
0750720 000b bb44 0000 00a8 b27c b66c 0000 014b 0000 0156 c00b baa0 0200 0db5 0500 1cdd 0000 3a6f 0000 001b 0000 39cf 005b 3b03
0751000 0000 024b 0000 315f 000b bad4 0000 0038 b27c b66c 0000 014c 0000 0157 000b bad8 0200 0db5 0500 1cdd 0000 2e7f 0000 001b
0751060 0000 39cf 005b 3983 0000 024b 0000 315f 000b bb44 0000 0038 b27c b66c 0000 014d 0000 0158 000b bb48 0200 0db5 0500 1cdd
0751140 0000 3a77 0000 001b 0000 39cf 005b 3c83 0000 024b 0000 315f 2c78 0036 0002 438a 2520 4754 33a0 247c 0008 c1fc 0014 2ba0
0751220 0014 0010 3774 5aec 0100 2fdf 6d50 2c88 000a 2c58 3788 4a7c 000c 2ecc 723c 7175 000b bbc8 0000 0038 b27c b66c 0000 014e
0751300 0000 0159 000b bbcc 0200 0db5 0500 1cdd 0000 3a7f 0000 001b 0000 39cf 005b 3e83 0000 024b 0000 315f 2c78 004a 0002 438a
0751360 2520 4740 33bc 247c 0008 c1fc 0014 2ba0 0014 001c 3788 5aec 0100 2fdf 671c 37dc 24d0 0000 000b 6700 0014 2c88 000e 2c58
0751440 37dc 4078 000b 6700 0010 2ecc 9300 9974 22a0 6179 000b c284 0000 0038 b130 b66c 0000 014f 0000 015a 000b b975 0200 0db5
0751520 0500 1cdd 0000 3c7f 0000 0013 0000 39cf 0060 1e23 0000 024b 0000 315f 27f0 0682 000b 8dbc 2520 46d8 3410 001c 4550 4af8
0751600 0000 0103 5370 4580 4b8c 0000 0000 0173 6bb4 4550 4b8c 0000 0000 030b 6c34 4580 4b3c 0000 0000 030b 6bb4 4550 4b8c 0000
0751660 0000 03ab 6c34 4580 4b8c 0000 0000 03a3 6bb4 4550 4b8c 0000 0000 034b 6c34 4580 4b8c 0000 0000 030b 6bb4 4550 4b8c 0000
0751740 0000 0163 6c34 4580 4b8c 0000 0000 030b 6bb4 4550 4b8c 0000 0000 030b 6c34 4580 4b8c 0000 0000 03ab 6bb4 4550 4b8c 0000
0752020 0000 03a3 6c34 4580 4b8c 0000 0000 034b 6bb4 4550 4b8c 0000 0000 030b 6c34 4580 4b8c 0000 0000 0163 6bb4 4550 4b8c 0000
0752100 0000 030b 6c34 4580 4b8c 0000 0000 030b 6bb4 4550 4b8c 0000 0000 03ab 6c34 4580 4b8c 0000 0000 03a3 6bb4 4550 4b8c 0000
0752160 0000 034b 6c34 4580 4b8c 0000 0000 030b 6bb4 4550 4b8c 0000 0000 0163 6c34 4580 4b8c 0000 0000 017b 6bb4 4550 4b8c 0000
0752240 0000 0153 6c34 4580 4b8c 0000 0000 0103 6bb4 4550 4b8c 0000 0000 0173 6c34 4580 4b8c 0000 0000 0163 6bb4 4550 4b8c 0000
0752320 0000 0163 6c34 4580 4b8c 0000 0000 017b 6bb4 4550 4b8c 0000 0000 0153 6c34 4580 4b8c 0000 0000 0103 6bb4 4550 4b8c 0000
0752400 0000 0103 6c34 4580 4b8c 0000 0000 0103 6bb4 4550 4b8c 0000 0000 0103 6c34 4580 4b8c 0000 0000 004b 6bb4 4550 4b8c 0000
0752460 0000 0053 6c34 4580 4b8c 0000 0000 0103 6bb4 4550 4b8c 0000 0000 0173 6c34 4580 4b8c 0000 0000 030b 6bb4 4550 4b8c 0000
0752540 0000 030b 6c34 4580 4b8c 0000 0000 03ab 6bb4 4550 4b8c 0000 0000 03a3 6c34 4580 4b8c 0000 0000 034b 6bb4 4550 4b8c 0000
0752620 0000 030b 6c34 4580 4b8c 0000 0000 0163 6bb4 4550 4b8c 0000 0000 030b 6c34 4580 4b8c 0000 0000 030b 6bb4 4550 4b8c 0000
0752700 0000 03ab 6c34 4580 4b8c 0000 0000 03a3 6bb4 4550 4b8c 0000 0000 034b 6c34 4580 4b8c 0000 0000 030b 6bb4 4550 4b8c 0000
0752760 0000 0163 6c34 4580 4b8c 0000 0000 030b 6bb4 4550 4b8c 0000 0000 030b 6c34 4580 4b8c 0000 0000 03ab 6bb4 4550 4b8c 0000
0753040 0000 03a3 6c34 4580 4b8c 0000 0000 034b 6bb4 4550 4b8c 0000 0000 030b 6c34 4580 4b8c 0000 0000 0103 6bb4 4550 4b8c 0000
0753120 0000 0173 6c34 4580 4b8c 0000 0000 0163 6bb4 71d0 4550 4af8 0000 0163 6c34 4580 4b8c 0000 0000 0113 6bb4 4550 4b8c 0000
0753200 0000 0103 6c34 4580 4b8c 0000 0000 0103 6bb4 4550 4b8c 0000 0000 0103 6c34 4580 4b8c 0000 0000 0103 6bb4 4550 4b8c 0000
0753260 0000 004b 6c34 4580 4b8c 0000 0000 0053 6bb4 4550 4b8c 0000 0000 0173 6c34 4580 4b8c 0000 0000 013b 6bb4 4550 4b8c 0000
0753340 0000 0103 6c34 4580 4b8c 0000 0000 0173 6bb4 4550 4b8c 0000 0000 030b 6c34 4580 4b8c 0000 0000 030b 6bb4 4550 4b8c 0000
0753420 0000 03ab 6c34 4580 4b8c 0000 0000 03a3 6bb4 4550 4b8c 0000 0000 034b 6c34 4580 4b8c 0000 0000 030b 6bb4 4550 4b8c 0000
0753500 0000 0163 6c34 4580 4b8c 0000 0000 030b 6bb4 4550 4b8c 0000 0000 030b 6c34 4580 4b8c 0000 0000 03ab 6bb4 4550 4b8c 0000
0753560 0000 03a3 6c34 4580 4b8c 0000 0000 034b 6bb4 4550 4b8c 0000 0000 030b 6c34 4580 4b8c 0000 0000 0163 6bb4 4550 4b8c 0000
0753640 0000 030b 6c34 4580 4b8c 0000 0000 030b 6bb4 4550 4b8c 0000 0000 03ab 6c34 4580 4b8c 0000 0000 03a3 6bb4 4550 4b8c 0000
0753720 0000 034b 6c34 4580 4b8c 0000 0000 030b 6bb4 4550 4b8c 0000 0000 0163 6c34 4580 4b8c 0000 0000 013b 6bb4 4550 4b8c 0000
0754000 0000 013b 6c34 4580 4b8c 0000 0000 0163 6bb4 4550 4b8c 0000 0000 013b 6c34 4580 4b8c 0000 0000 013b 6bb4 4550 4b8c 0000
0754060 0000 0103 6c34 4580 4b8c 0000 0000 0173 6bb4 4550 4b8c 0000 0000 0163 6c34 4580 4b8c 0000 0000 0163 6bb4 4550 4b8c 0000
0754140 0000 013b 6c34 4580 4b8c 0000 0000 0103 6bb4 4550 4b8c 0000 0000 0103 6c34 4580 4b8c 0000 0000 0103 6bb4 4550 4b8c 0000
0754220 0000 0103 6c34 4580 4b8c 0000 0000 004b 6bb4 4550 4b8c 0000 0000 0053 6c34 4580 4b8c 0000 0000 0173 6bb4 4550 4b8c 0000
0754300 0000 0103 6c34 247c 000b 8848 0020 3348 40b4 001c 000b 8b3c 001c 32d4 24d0 0000 0008 bafc 001c 3a4c 0008 e17c 001c 329c
0754360 24d0 0000 0008 d89c 001c 40a0 0008 e17c 0018 408c 0008 b95c 0014 41e8 0000 3c87 3788 8d94 aab4 0000 a260 43c0 0200 0abf
0754440 4b8c 0000 0000 3c8f 4b8c 0000 0000 3c8f 44a0 0000 0200 0abf 4b8c 0000 0000 3c8f 6b74 43c0 0200 0abf 4b8c 0000 0000 06df
0754520 6bb4 43e4 0200 0abf 4b8c 0000 0000 06df 6b74 3788 8d94 aab4 0000 a260 447c 0000 0200 0abf 4b8c 0000 0000 3c8f 4b8c 0000
0754600 0000 3c8f 44a0 0000 0200 0abf 4b8c 0000 0000 3c8f 6b74 3788 8d94 aab4 0000 a260 44a0 0000 0200 0abf 4b8c 0000 0000 3c8f
0754660 4b8c 0000 0000 3c8f 447c 0000 0200 0abf 4b8c 0000 0000 3c8f 6bb4 43e4 0200 0abf 4b8c 0000 0000 3c97 6b74 3788 8d94 aab4
0754740 0000 a260 2ecc 3100 4a7c 000c 723c 7320 000b d64c 0000 1140 6820 6375 7272 656e 7420 696e 7075 7420 636f 6d69 6e67 2066
0755020 726f 6d20 6120 6e65 7720 7374 7265 616d 2063 6f6e 6e65 6374 6564 0a25 2020 2074 6f20 4669 6c65 4e61 6d65 2c20 7468 656e
0755100 2063 6c6f 7365 7320 7468 6174 2073 7472 6561 6d2e 2020 5468 6973 2069 7320 616e 2069 6e66 6978 206f 7065 7261 746f 722e
0755160 0a0a 6672 6f6d 5f66 696c 6528 476f 615c 2c20 4669 6c65 4e61 6d65 2920 3a2d 0a09 6375 7272 656e 745f 696e 7075 7428 4f6c
0755240 6453 7472 6561 6d29 2c0a 096f 7065 6e28 4669 6c65 4e61 6d65 2c20 7265 6164 2c20 4e65 7753 7472 6561 6d29 2c0a 0973 6574
0755320 5f69 6e70 7574 284e 6577 5374 7265 616d 292c 0a09 2820 2020 6361 6c6c 2847 6f61 6c29 202d 3e20 466c 6167 203d 2031 203b
0755400 2046 6c61 6720 3d20 3020 2020 292c 0a09 7365 745f 696e 7075 7428 4f6c 6453 7472 6561 6d29 2c0a 0963 6c6f 7365 284e 6577
```

```
0755460  5374 7265 616d 292c 0a09 466c 6167 203e 2030 2e0a 0a0a 2520 2020 6f6e 746f 5f66 696c 6528 2b47 6f61 6c2c 202b 4669 6c65
0755540  4e61 6d65 290a 2520 2020 6578 6563 7574 6573 2047 6f61 6c20 7769 7468 2063 7572 7265 6e74 206f 7574 7075 7420 676f 696e
0755620  6720 746f 2061 206e 6577 2073 7472 6561 6d20 636f 6e6e 6563 7465 640a 2520 2020 746f 2046 696c 654e 616d 652c 2074 6865
0755700  6e20 636c 6f73 6573 2074 6861 7420 7374 7265 616d 2e20 2054 6869 7320 6973 2061 6e20 696e 6669 7820 6f70 6572 6174 6f72
0755760  2e0a 0a6f 6e74 6f5f 6669 6c65 2847 6f61 6c2c 2046 696c 654e 616d 6529 203a 2d0a 0963 7572 7265 6e74 5f6f 7574 7075 7428
0756040  4f6c 6453 7472 6561 6d29 2c0a 096f 7065 6e28 4669 6c65 4e61 6d65 2c20 7772 6974 652c 204e 6577 5374 7265 616d 292c 0a09
0756120  7365 745f 6f75 7470 7574 284e 6577 5374 7265 616d 292c 0a09 2820 2020 6361 6c6c 2847 6f61 6c29 202d 3e20 466c 6167 203d
0756200  2031 203b 2046 6c61 6720 3d20 3020 202c 292c 0a09 7365 745f 6f75 7470 7574 284f 6c64 5374 7265 616d 292c 0a09 636c 6f73
0756260  6528 4e65 7753 7472 6561 6d29 2c0a 0946 6c61 6720 3e20 302e 0a0a 0a25 2020 2066 726f 6d5f 7374 7265 616d 282b 476f 616c
0756340  2c20 2b53 7472 6561 6d29 0a25 2020 2065 7865 6375 7465 7320 476f 616c 2077 6974 6820 6375 7272 656e 7420 696e 7075 7420
0756420  636f 6d69 6e67 2066 726f 6d20 5374 7265 616d 2c20 7768 6963 6820 6d75 7374 2062 650a 2520 2020 6f70 656e 2c20 616e 6420
0756500  7769 6c6c 206e 6f74 2062 6520 636c 6f73 6564 2e20 2054 6869 7320 6973 2061 6e20 696e 6669 7820 6f70 6572 6174 6f72 2e0a
0756560  0a66 726f 6d5f 7374 7265 616d 2847 6f61 6c2c 204e 6577 5374 7265 616d 2920 3a2d 0a09 6375 7272 656e 745f 696e 7075 7428
0756640  4f6c 6453 7472 6561 6d29 2c0a 0973 6574 5f69 6e70 7574 284e 6577 5374 7265 616d 292c 0a09 2820 2020 6361 6c6c 2847 6f61
0756720  6c29 202d 3e20 466c 6167 203d 2031 203b 2046 6c61 6720 3d20 3020 2020 292c 0a09 7365 745f 696e 7075 7428 4f6c 6453 7472
0757000  6561 6d29 2c0a 0946 6c61 6720 3e20 302e 0a0a 0a25 2020 206f 6e74 6f5f 7374 7265 616d 282b 476f 616c 2c20 2b53 7472 6561
0757060  6d29 0a25 2020 2065 7865 6375 7465 7320 476f 616c 2077 6974 6820 6375 7272 656e 7420 6f75 7470 7574 2067 6f69 6e67 2074
0757140  6f20 5374 7265 616d 2c20 7768 6963 6820 6d75 7374 2062 650a 2520 2020 6f70 656e 2c20 616e 6420 7769 6c6c 206e 6f74 2062
0757220  6520 636c 6f73 6564 2e20 2054 6869 7320 6973 2061 6e20 696e 6669 7820 6f70 6572 6174 6f72 2e0a 0a6f 6e74 6f5f 7374 7265
0757300  616d 2847 6f61 6c2c 204e 6577 5374 7265 616d 2920 3a2d 0a09 6375 7272 656e 745f 6f75 7470 7574 284f 6c64 5374 7265 616d
0757360  292c 0a09 7365 745f 6f75 7470 7574 284e 6577 5374 7265 616d 292c 0a09 2820 2020 6361 6c6c 2847 6f61 6c29 202d 3e20 466c
0757440  6167 203d 2031 203b 2046 6c61 6720 3d20 3020 2020 292c 0a09 7365 745f 6f75 7470 7574 284f 6c64 5374 7265 616d 292c 0a09
0757520  466c 6167 203e 2030 2e0a 0a0a 2520 2020 6672 6f6d 5f63 6861 7273 282b 476f 616c 2c20 2b43 6861 7273 290a 2520 2020 6578
0757600  6563 7574 6573 2047 6f61 6c20 7769 7468 2063 7572 7265 6e74 2069 6e70 7574 2063 6f6d 696e 6720 6672 6f6d 2061 206e 6577
0757660  2073 7472 6561 6d20 7768 6f73 650a 2520 2020 636f 6e74 656e 7473 2061 7265 2063 6f70 6965 6420 6672 6f6d 2043 6861 7273
0757740  2c20 7768 6963 6820 6d75 7374 2062 6520 6120 7072 6f70 6572 206c 6973 7420 6f66 0a25 2020 2063 6861 7261 6374 6572 2063
0760020  6f64 6573 2e20 2054 6865 6e20 7468 6520 6e65 7720 7374 7265 616d 2069 7320 636c 6f73 6564 2e20 2054 6869 7320 6361 6e20
0760100  6265 0a25 2020 2075 7365 6420 6173 2061 6e20 696e 6669 7820 6f70 6572 6174 6f72 2e0a 0a66 726f 6d5f 6368 6172 7328 476f
0760160  616c 2c20 4368 6172 7329 203a 2d0a 0977 6974 685f 696e 7075 745f 6672 6f6d 5f63 6861 7273 2847 6f61 6c2c 2043 6861 7273
0760240  292e 0a0a 0a25 2020 206f 6e74 6f5f 6368 6172 7328 2b47 6f61 6c2c 203f 4368 6172 7329 0a25 2020 2065 7865 6375 7465 7320
0760320  476f 616c 2077 6974 6820 6375 7272 656e 7420 6f75 7470 7574 2067 6f69 6e67 2074 6f20 6120 6e65 7720 7374 7265 616d 2e20
0760400  2041 6674 6572 0a25 2020 2047 6f61 6c20 6861 7320 6669 6e69 7368 6564 2c20 7468 6520 6e65 7720 7374 7265 616d 2069 7320
0760460  636c 6f73 6564 2c20 616e 6420 4368 6172 7320 6973 0a25 2020 2075 6e69 6669 6564 2077 6974 6820 6120 6c69 7374 206f 6620
0760540  7468 6520 6368 6172 6163 7465 7273 2077 6869 6368 2077 6572 6520 7772 6974 7465 6e20 746f 0a25 2020 2074 6861 7420 7374
0760620  7265 616d 2e20 2054 6869 7320 6361 6e20 6265 2075 7365 6420 6173 2061 6e20 696e 6669 7820 6f70 6572 6174 6f72 2e0a 0a6f
0760700  6e74 6f5f 6368 6172 7328 476f 616c 2c20 4368 6172 7329 203a 2d0a 0977 6974 685f 6f75 7470 7574 5f74 6f5f 6368 6172 7328
0760760  476f 616c 2c20 4368 6172 7329 2e0a 0a0a 0a25 2020 2063 6f70 795f 6279 7465 730a 2520 2020 636f 7069 6573 2063 6861 7261
0761040  6374 6572 7320 6672 6f6d 2074 6865 2063 7572 7265 6e74 2069 6e70 7574 2073 7472 6561 6d20 746f 2074 6865 2063 7572 7265
0761120  6e74 0a25 2020 206f 7574 7075 7420 7374 7265 616d 2e20 2049 7420 6973 2062 6573 7420 7573 6564 2077 6974 6820 7468 6520
0761200  492f 4f20 7265 6469 7265 6374 696f 6e20 6f70 6572 6174 6f72 730a 2520 2020 6465 6669 6e65 6420 696e 2074 6869 7320 6669
0761260  6c65 2c20 652e 672e 0a25 0963 6f70 795f 6279 7465 7320 6672 6f6d 5f66 696c 6520 2766 7265 642e 706c 2720 6f6e 746f 5f73
0761340  7472 6561 6d20 4f75 7470 7574 0a0a 636f 7079 5f62 7974 6573 203a 2d0a 0972 6570 6561 742c 0a09 2020 2020 6765 7430 2843
0761420  292c 0a09 2020 2020 2820 2020 4320 3e3d 2030 202d 3e20 7075 7428 4329 2c20 6661 696c 0a09 2020 2020 3b20 2020 7472 7565
0761500  0a09 2020 2020 292c 0a09 212e 0a0a 0a0a 2520 2020 7772 6974 656c 6e28 2b4c 6973 744f 6654 6572 6d73 290a 2520 2020 7772
0761560  6974 6573 2065 6163 6820 6f66 2074 6865 2054 6572 6d73 2069 6e20 4c69 7374 4f66 5465 726d 7320 7573 696e 6720 7772 6974
0761640  652f 312c 2074 6865 6e0a 2520 2020 7772 6974 6573 2061 206e 6577 6c69 6e65 2e20 2059 6f75 2070 726f 6261 626c 7920 7761
0761720  6e74 2066 6f72 6d61 742f 3220 696e 7374 6561 642e 0a0a 7772 6974 656c 6e28 5b5d 2920 3a2d 0a09 6e6c 2e0a 7772 6974 656c
0762000  6e28 5b48 6561 647c 5461 696c 5d29 203a 2d0a 0977 7269 7465 2848 6561 6429 2c0a 0977 7269 7465 6c6e 2854 6169 6c29 2e0a
0762060  0a0b ccc6 0000 017b 000b ccce 0000 03b3 000b ccd6 0000 034b 000b ccde 0000 0353 000b cce6 0000 033b 000b ccee 0000 03cb
0762140  000b ccf6 0000 017b 000b ccfe 0000 02b3 000b cd06 0000 0243 000b cd0e 0000 0223 000b cd16 0000 0263 000b cd1e 0000 017b
0762220  000b cd26 0000 0383 000b cd2e 0000 033b 000b cd36 0000 0393 000b cd3e 0000 039b 000b cd46 0000 032b 000b cd4e 0000 0393
0762300  000b cd56 0000 017b 000b cd5e 0000 0383 000b cd66 0000 0393 000b cd6e 0000 037b 000b cd76 0000 0363 000b cd7e 0000 037b
0762360  000b cd86 0000 033b 000b cd8e 0000 017b 000b cd96 0000 0373 000b cd9e 0000 032b 000b cda6 0000 03bb 000b cdae 0000 0373
0762440  000b cdb6 0000 032b 000b cdbe 0000 03bb 000b cdc6 0000 017b 000b cdce 0000 03b3 000b cdd6 0000 019b 000b cdde 0000 0173
0762520  000b cde6 0000 018b 000b cdee 0000 017b 000b cdf6 0000 0383 000b cdfe 0000 0393 000b ce06 0000 037b 000b ce0e 0000 03a3
```

```
0762600 000b ce16 0000 030b 000b ce1e 0000 0363 000b ce26 0000 035b 000b ce2e 0000 02fb 000b ce36 0000 03ab 000b ce3e 0000 03a3
0762660 000b ce46 0000 034b 000b ce4e 0000 0363 000b ce56 0000 039b 0000 0007 0000 0173 000b ce66 0000 0383 000b ce6e 0000 0363
0762740 0000 0007 0000 039b 000b 406e 0000 017b 0000 0007 0000 0343 000b ce7e 0000 037b 000b ce86 0000 036b 000b ce8e 0000 032b
0763020 000b ce96 0000 017b 000b ce9e 0000 037b 000b cea6 0000 039b 000b ceae 0000 030b 000b ceb6 0000 039b 000b cebe 0000 018b
0763100 000b cec6 0000 017b 000b cece 0000 030b 000b ced6 0000 017b 000b cede 0000 03b3 000b cee6 0000 034b 000b ceee 0000 0353
0763160 000b cef6 0000 030b 000b cefe 0000 03cb 000b cf06 0000 017b 000b cf0e 0000 02b3 000b cf16 0000 0243 000b cf1e 0000 0223
0763240 000b cf26 0000 0263 000b cf2e 0000 017b 000b cf36 0000 0383 000b cf3e 0000 030b 000b cf46 0000 0393 000b cf4e 0000 039b
0763320 000b cf56 0000 032b 000b cf5e 0000 0393 000b cf66 0000 017b 000b cf6e 0000 0383 000b cf76 0000 0393 000b cf7e 0000 037b
0763400 000b cf86 0000 0363 000b cf8e 0000 037b 000b cf96 0000 033b 000b cf9e 0000 017b 000b cfa6 0000 0373 000b cfae 0000 032b
0763460 000b cfb6 0000 03bb 000b cfbe 0000 0373 000b cfc6 0000 032b 000b cfce 0000 03bb 000b cfd6 0000 017b 000b cfde 0000 03b3
0763540 000b cfe6 0000 019b 000b cfee 0000 0173 000b cff6 0000 018b 000b cffe 0000 017b 000b d006 0000 0393 000b d00e 0000 0393
0763620 000b d016 0000 037b 000b d01e 0000 03a3 000b d026 0000 030b 000b d02e 0000 0363 000b d036 0000 035b 000b d03e 0000 02fb
0763700 000b d046 0000 03ab 000b d04e 0000 03a3 000b d056 0000 034b 000b d05e 0000 0363 000b d066 0000 039b 000b d06e 0000 017b
0763760 000b d086 0000 0343 000b d08e 0000 037b 000b d096 0000 036b 000b d09e 0000 032b 000b d0a6 0000 017b 000b d0ae 0000 037b
0764040 000b d0b6 0000 039b 000b d0be 0000 030b 000b d0c6 0000 039b 000b d0ce 0000 018b 000b d0d6 0000 017b 000b d0de 0000 030b
0764120 000b d0e6 0000 017b 000b d0ee 0000 03b3 000b d0f6 0000 034b 000b d0fe 0000 0353 000b d106 0000 030b 000b d10e 0000 03cb
0764200 000b d116 0000 017b 000b d11e 0000 02b3 000b d126 0000 0243 000b d12e 0000 0223 000b d136 0000 0263 000b d13e 0000 017b
0764260 000b d146 0000 0383 000b d14e 0000 030b 000b d156 0000 0393 000b d15e 0000 039b 000b d166 0000 032b 000b d16e 0000 0393
0764340 000b d176 0000 017b 000b d17e 0000 0383 000b d186 0000 0393 000b d18e 0000 037b 000b d196 0000 0363 000b d19e 0000 037b
0764420 000b d1a6 0000 033b 000b d1ae 0000 017b 000b d1b6 0000 0373 000b d1be 0000 032b 000b d1c6 0000 03bb 000b d1ce 0000 0373
0764500 000b d1d6 0000 032b 000b d1de 0000 03bb 000b d1e6 0000 017b 000b d1ee 0000 03b3 000b d1f6 0000 019b 000b d1fe 0000 0173
0764560 000b d206 0000 018b 000b d20e 0000 017b 000b d216 0000 0383 000b d21e 0000 0393 000b d226 0000 037b 000b d22e 0000 03a3
0764640 000b d236 0000 030b 000b d23e 0000 0363 000b d246 0000 035b 000b d24e 0000 02fb 000b d256 0000 03ab 000b d25e 0000 03a3
0764720 000b d266 0000 034b 000b d26e 0000 0363 000b d276 0000 039b 000b ce5e 0000 53db 000b d286 0000 06cb 0000 0007 0017 9603
0765000 000b d296 0002 10a3 0000 0007 0000 017b 000b d2a6 0000 0343 000b d2ae 0000 037b 000b d2b6 0000 036b 000b d2be 0000 032b
0765060 000b d2c6 0000 017b 000b d2ce 0000 037b 000b d2d6 0000 039b 000b d2de 0000 030b 000b d2e6 0000 039b 000b d2ee 0000 018b
0765140 000b d2f6 0000 017b 000b d2fe 0000 030b 000b d306 0000 017b 000b d30e 0000 03b3 000b d316 0000 034b 000b d31e 0000 0353
0765220 000b d326 0000 030b 000b d32e 0000 03cb 000b d336 0000 017b 000b d33e 0000 02b3 000b d346 0000 0243 000b d34e 0000 0223
0765300 000b d356 0000 0263 000b d35e 0000 017b 000b d366 0000 0383 000b d36e 0000 030b 000b d376 0000 0393 000b d37e 0000 039b
0765360 000b d386 0000 032b 000b d38e 0000 0393 000b d396 0000 017b 000b d39e 0000 0383 000b d3a6 0000 0393 000b d3ae 0000 037b
0765440 000b d3b6 0000 0363 000b d3be 0000 037b 000b b30c 0300 22d7 0000 3a97 0000 000c 000a 18f0 000a 18f0 0000 0000 0000 0000
0765520 0005 5150 5f4c 3000 0011 2f74 6d70 2f71 706c 696e 6b39 3132 372e 6300 0011 2f74 6d70 2f71 706c 696e 6b39 3132 372e 6f00
0765600 0009 636f 7079 5f61 7267 7300 2c78 0012 0002 438a 4e1c 0000 0000 3c6f 228c 0000 000e 2f74 6d70 2f71 7073 796d 3931 3237
0765660 000b d446 000f 2f74 6d70 2f71 706c 6f61 6439 3132 3700 030b 0000 002c 0016 bf10 b27c b66c 0000 00f0 7fff ffff 000b d4b8
0765740 0200 0db5 0200 22ed 0000 3b47 005e c003 0000 315f 0000 002c 000b d48c b4f0 b4e4 0000 00ef 7fff ffff 0008 c0dd 0000 01fc
0766020 0000 0059 000b d460 0002 438a 0013 c07c 0000 002c 000b d460 b27c b66c 0000 00f1 7fff ffff 000b d4e4 0200 0db5 0200 22ed
0766100 0000 3baf 005e c223 0000 315f 0000 002c 000b d4b8 b27c b66c 0000 00f2 7fff ffff 000b d510 0200 0db5 0200 22ed 0000 3b67
0766160 005e c2c3 0000 315f 0000 002c 000b d4e4 b27c b66c 0000 00f3 7fff ffff 000b d53c 0200 0db5 0200 22ed 0000 3b9f 005e c323
0766240 0000 315f 0000 002c 000b d510 b27c b66c 0000 00f4 7fff ffff 000b d568 0200 0db5 0200 22ed 0000 3b8f 005e c3a3 0000 315f
0766320 0000 002c 000b d53c b27c b66c 0000 00f5 7fff ffff 000b d594 0200 0db5 0200 22ed 0000 3b57 005e d083 0000 315f 0000 002c
0766400 000b d568 b27c b66c 0000 00f6 7fff ffff 000b d5c0 0200 0db5 0200 22ed 0000 3b87 005e d423 0000 315f 0000 002c 000b d594
0766460 b27c b66c 0000 00f7 7fff ffff 000d 188c 0200 0db5 0200 22ed 0000 3b7f 005e c463 0000 315f 0000 0038 0016 bfc0 b27c b66c
0766540 0000 00f8 7fff ffff 000d 10d8 0200 0db5 0300 22e5 0000 0001 0000 3bd7 0000 0007 0000 0007 0000 3a97 0000 315f 0000 002c
0766620 000b d624 b4f0 b4e4 0000 00f7 7fff ffff 0008 c0bd 0000 0000 0000 0000 000b d5ec 000b ddc8 000b dc00 000b e08c 0000 01b8
0766700 b288 b66c 0000 00f9 7fff ffff 000b dddc 0200 0db5 0100 15ad 0100 33fd 0000 000b 0000 315f 000b d6a4 0000 002c b288 b66c
0766760 0000 00f9 7fff ffff 000b d650 0200 0db5 0100 15ad 0100 33fd 0000 000b 0000 315f 000b d6d0 0000 002c b288 b66c 0000 00f9
0767040 7fff ffff 000b d67c 0200 0db5 0100 15ad 0100 33fd 0000 000b 0000 315f 000b d6fc 0000 002c b288 b66c 0000 00f9 7fff ffff
0767120 000b d6a8 0200 0db5 0100 15ad 0100 33fd 0000 000b 0000 315f 000b de2c 0000 0108 000b d6e5 0000 315f 0056 81c3 0100 2f6f
0767200 0056 81c3 0000 017b 000b d71e 0000 0343 000b d726 0000 037b 000b d72e 0000 036b 000b d736 0000 032b 000b d73e 0000 017b
0767260 000b d746 0000 037b 000b d74e 0000 039b 000b d756 0000 030b 000b d75e 0000 039b 000b d766 0000 018b 000b d76e 0000 017b
0767340 000b d776 0000 030b 000b d77e 0000 017b 000b d786 0000 03b3 000b d78e 0000 034b 000b d796 0000 0353 000b d79e 0000 030b
0767420 000b d7a6 0000 03cb 000b d7ae 0000 017b 000b d7b6 0000 02b3 000b d7be 0000 0243 000b d7c6 0000 0223 000b d7ce 0000 0263
0767500 000b d7d6 0000 017b 000b d7de 0000 0383 000b d7e6 0000 030b 000b d7ee 0000 0393 000b d7f6 0000 039b 000b d7fe 0000 032b
0767560 9de3 bfa0 7ffd 6486 9006 0019 ba10 0008 8090 001d 0280 000a 8090 0019 0280 0008 9210 2020 b007 4018 d22e 0000 9410 202e
0767640 d42e 2001 9610 2020 d62e 2002 81c7 e008 91e8 001d 9de3 bfa0 7ffd 654c 9010 0018 81c7 e008 81e8 0000 d02a 4000 81c3 e008
```

```
0767720  9002 6001 d40a 4000 d422 0000 81c3 e008 9002 6001 d402 200c d422 4000 d602 0000 d002 2004 81c3 e008 9022 c009 9de3 bfa0
0770000  8090 0018 0280 000f 0100 0000 d006 2008 8090 0008 0280 000b 0100 0000 d206 200c 8090 0009 0280 0005 0100 0000 7ffd 652f
0770060  d006 200c c026 200c 7ffd 652c 9010 0018 81c7 e008 81e8 0000 d202 2008 8090 0009 3280 0010 9010 3fff da02 2004 9a23 6001
0770140  da22 2004 9a03 6001 8090 000d 2280 0007 9410 2001 d802 2010 9803 2001 d822 2010 1090 0004 d00b 3fff d422 2008 9010 3fff
0770220  81c3 e008 0100 0000 9de3 bfa0 d006 6004 8090 0008 3280 0021 e406 6010 fa06 4000 f606 600c 7ffd 6436 912f 6001 b810 0008
0770300  8090 001c 3280 0006 9407 0013 9210 2001 ba10 3fff 1080 001c d226 6008 d426 6010 f826 600c fa26 6004 d806 4000 8090 001d
0770360  9803 001d 0280 0009 d826 4000 de0e c000 ba27 6001 8090 001d de2f 0000 b606 e001 12bf fffb b807 2001 d006 6004 7ffd 64f3
0770440  9026 c008 e406 6010 ba10 0018 a404 a001 e426 6010 f02c bfff e806 6004 a825 2001 e826 6004 81c7 e008 91e8 001d 81c3 e008
0770520  d002 2008 9de3 bfa0 9010 2001 d026 2008 7fff ffa7 9010 0018 81c7 e008 91e8 2000 9210 2001 d222 2008 81c3 e008 9000 2000
0770600  9de3 bf98 7ffd 6402 9010 2014 ba10 0008 8090 001d 3280 0004 f227 6004 1080 0014 ba10 2000 f227 4000 f027 6010 f027 600c
0770660  c027 6008 1300 02f6 9212 61e4 1223 a05c 1300 02f6 1900 02f6 9813 21dc 9212 60d8 f423 a060 9a10 2000 9610 2000 9410 2000
0770740  7ffd 5bac 9010 001d ba10 0008 81c7 e008 91e8 001d 9de3 bf98 7ffd 63e5 9010 2080 b810 0008 8090 001c 2280 0021 ba10 2000
0771020  7ffd 63df 9010 2014 ba10 0008 8090 001d 3280 0006 9010 2080 7ffd 64b0 9010 001c 1080 0017 ba10 2000 d027 6004 9210 2080
0771100  d227 4000 f827 6010 f827 600c c027 6008 fa26 0000 1500 02f6 9412 a200 d423 a05c 1500 02f6 1900 02f6 9813 21dc 9412 a128
0771160  f223 a060 9210 2000 9010 001d 9a10 2000 7ffd 5b84 9610 2000 ba10 0008 81c7 e008 91e8 001d 0000 0000 000b d800 000b d844
0771240  000b d858 000b d864 000b d874 000b da10 000b da84 000b d88c 0000 0000 0000 0000 4028 2329 3839 2f30 382f 3238 2063 6861
0771320  7273 696f 2e63 0933 332e 3100 0000 0000 0000 0000 0000 0000 0000 0000 0000 0000 0000 0000 0000 0000 0000 0000 0000 0000
0771400  0000 0000 0000 0000 0000 0000 0000 0000 0000 0000 0000 0000 0000 0000 0000 0000 0000 0000 0000 0000 0000 0000 0000 0000
*
0771540  0000 0000 0000 0000 0000 0000 0000 0000 0000 0000 0000 3b47 b328 253f 000b d464 0000 0000 0000 3baf b328 0abf 000b d4bc
0771620  0000 0000 000f 4c68 0000 0000 0000 3b67 b328 118f 000b d4e8 0000 0000 0000 3b57 b328 dc14 000b d56c 0000 0000 0015 3168
0771700  000f 4e30 0000 3b9f b328 0abf 000b d514 0000 0000 0000 3b8f b328 dc61 000b d540 0000 0000 2c78 001e 0002 438a 7ae4 0000
0771760  8068 805c 7ebc 0000 000d 1c00 0008 88ec 228c dca4 0000 3b87 b328 0abf 000b d598 0000 0000 0000 3b7f b328 dca1 000b d5c4
0772040  0000 0000 2c78 001e 0002 438a 7ae4 000c 8130 8124 7ebc 0000 000b d800 0008 8990 228c dcc9 0008 d60c 0100 3baf 0000 3a97
0772120  0000 0004 000b dcf4 000b dcf4 0021 0000 0000 0000 2c78 0018 0002 438a 7ae4 0000 81b8 7c28 000b d844 0004 228c 2c78 001e
0772200  0002 438a 7ae4 0000 81c4 8124 7ebc 0000 000b d858 0008 8990 228c dd21 2c78 0020 0002 438a 7ae4 0004 81c4 7ed4 7ebc 0000
0772260  000b d964 0008 8990 88ac 228c 2c78 0020 0002 438a 7ae4 0004 7ed4 81b8 7ebc 0000 000b d874 0008 88ec 8964 228c 2c78 0020
0772340  0002 438a 7ae4 0004 7ed4 8130 81b8 7c28 000b da10 000c 8908 88e4 228c 2c78 0022 0002 438a 7ed4 0008 7ed4 7ed4 7ebc 0000
0772420  000b da84 0008 89ec 8940 98c8 228c ddba 2c78 0018 0002 438a 7ae4 0000 81b8 7c28 000b d88c 0004 228c b464 253f 000b d5f0
0772500  000d 1900 000b 39d8 0000 0010 000b e08c 0000 0008 0009 736b 6970 5f6c 696e 6500 000f 696e 7374 616e 6365 5f6d 6574 686f
0772560  6400 0000 0008 6f62 6a5f 6361 6c6c 0010 b464 44f0 000b 2044 0000 0000 0006 6d65 7468 6f64 000b de28 0009 6669 6c65 6572
0772640  726e 6f00 0007 7067 656e 7379 6d00 b144 0013 4669 6c65 2074 6162 6c65 206f 7665 7266 6c6f 7700 0000 0006 7365 746f 6631
0772720  000b de64 b464 de2c 000a f088 000d 1834 0007 7772 6974 656c 6e00 de7c 0009 6f6e 746f 5f66 696c 6500 0009 6672 6f6d 5f66
0773000  696c 6500 0008 d7ec 0200 3c37 0000 3aa7 0000 0008 000c 0280 000c 0280 0001 004c 0000 0000 ffff ffff 0200 3aaf 0000 3aa7
0773060  0000 0008 000c 02a0 000c 02a0 0001 004c 0000 0000 0008 d80c 0200 3c3f 0000 3aa7 0000 0008 000b 9384 000b 9384 0001 004c
0773140  0000 0000 0008 d84c 0200 3c47 0000 3aa7 0000 0008 000b 9440 000b 9440 0001 004c 0000 0000 000a 3178 0000 0000 0002 3c3d
0773220  0000 0000 ffff ffff 0200 3c4f 0000 3aa7 0000 0008 000b 94fc 000b 94fc 0001 004c 0000 0000 ffff ffff 0200 3c57 0000 3aa7
0773300  0000 0008 000b 95a0 000b 95a0 0001 004c 0000 0000 0000 3c57 b328 df61 000b 8f38 0000 0000 ffff ffff 0000 3c5f 0000 3aa7
0773360  0000 0000 000b 96b4 000b 96b4 0001 004c 0000 0000 0000 3c5f b328 0abf 000b 8f6c 0000 0000 ffff ffff 0100 3c67 0000 3aa7
0773440  0000 0004 000c 02e8 000c 02e8 0001 004c 0000 0000 0000 3c67 b328 253f 000b 8fa0 0000 0000 0200 3c37 b328 0abf 000b 8fd4
0773520  0000 0000 0200 3aaf b328 dfe1 000b 9008 0000 0000 000a 2268 0000 0000 000b dfe4 000b dff4 0200 3c3f b328 253f 000b 903c
0773600  0000 0000 0200 3c47 b328 0abf 000b 9070 0000 0000 0200 3c4f b328 e021 000b 90a4 0000 0000 0200 3c57 b328 e031 000b 90d8
0773660  0000 0000 2c78 0044 0002 438a 45b8 2ba0 0010 0010 2410 0000 0008 c79c 0010 2c88 0004 2c58 3b4c 0000 0008 dc5c 000c 42ac
0773740  0000 3def 0008 ec1c 000c 247c 0008 d13c 000c 234c 0008 d79c 000b e248 0000 002c b4f0 b4e4 0000 01a3 7fff ffff 0008 c4fd
0774020  0000 0000 0000 0000 000b e150 0002 438a 000c 196c 0000 0034 000b e218 b27c b66c 0000 01a5 7fff ffff 000b e11c 0200 0db5
0774100  0400 2eb5 0000 23a7 0000 001b 0000 3287 0000 2c27 0000 315f 0000 002c 000b e0f0 b4f0 b4e4 0000 01a4 7fff ffff 0008 e1dd
0774160  0000 000c 0000 0004 000b e0bc 0002 438a 000c 1bdc 0000 0034 000b e0bc b27c b66c 0000 01a6 7fff ffff 000b e17c 0200 0db5
0774240  040c 2eb5 0000 294f 0000 0013 0000 3287 0000 2c27 0000 315f 0000 002c 000b 2040 b27c b66c 0000 01ae 7fff ffff 000a f47c
0774320  0200 0db5 0200 24bd 0000 3287 0000 38c7 0000 315f 0000 0034 000b e11c b27c b66c 0000 01a8 7fff ffff 000b e1b0 0200 0db5
0774400  0400 2eb5 0000 294f 0000 001b 0000 3287 0000 27c7 0000 315f 0000 0034 000b e17c b27c b66c 0000 01a9 7fff ffff 000b e1e4
0774460  0200 0db5 0400 2eb5 0000 2a77 0000 000b 0000 3287 0000 2c27 0000 315f 0000 0034 000b e1b0 b27c b66c 0000 01aa 7fff ffff
0774540  000b e218 0200 0db5 0400 2eb5 0000 2e1f 0000 0013 0000 3287 0000 2c27 0000 315f 0000 0034 000b e1e4 b27c b66c 0000 01ab
0774620  7fff ffff 000b e0f1 0200 0db5 0400 2eb5 0000 2e1f 0000 001b 0000 3287 0000 2c27 0000 315f 000c 1de0 0000 1e08 0000 0000
0774700  0000 0000 0000 0000 0000 0000 0000 0000 0000 0000 0000 0000 0000 0000 000c 15ad 0000 0000 000c 1158 0000 0000 000c 1258
0774760  0000 0000 000c 13d1 000c 1445 000c 11dc 000c 12c4 000c 13e4 0000 0000 000c 1600 000c 0e51 0000 0000 0000 0000 0000 0000
```

```
0775040 0000 0000 0000 0000 000c 1400 000c 1570 0000 0000 000c 0184 0000 1d88 000b e2c2 000b e2c9 000b e2da 0000 0abf 000b e2ea
0775120 0100 1d8f 0000 38c7 000b e2e1 000b e2fa 0100 1d8f 0000 0b3f 000b e2f1 000b e312 0000 0003 0000 0007 0100 253f 000b e302
0775200 000b e309 000b e31a 0000 0abf 000b e32a 0100 1d8f 0000 3997 000b e321 000b e33a 0100 1d8f 0000 0b3f 000b e331 000b e352
0775260 0000 001b 0000 0007 0100 253f 000b e342 000b e349 000b e35a 0000 0abf 000b e36a 0100 1d8f 0000 399f 000b e361 000b e37a
0775340 0100 1d8f 0000 0b3f 000b e371 000b e392 0000 000b 0000 0007 0100 253f 000b e382 000b e389 000b e39a 0000 0abf 000b e3aa
0775420 0100 1d8f 0000 399f 000b e3a1 000b e3ba 0100 1d8f 0000 0b3f 000b e3b1 000b e3d2 0000 0013 0000 0007 0100 253f 000b e3c2
0775500 000b e3c9 000b e3da 0000 0abf 000b e3ea 0100 1d8f 0000 39a7 000b e3e1 000b e3fa 0100 1d8f 0000 0b3f 000b e3f1 000b e412
0775560 0000 000b 0000 0007 0100 253f 000b e402 000b e409 000b e41a 0000 0abf 000b e42a 0100 1d8f 0000 39af 000b e421 000b e43a
0775640 0100 1d8f 0000 0b3f 000b e431 000b e452 0000 000b 0000 0007 0100 253f 000b e442 000b e449 000b e45a 0000 0abf 000b e46a
0775720 0100 1d8f 0000 39b7 000b e461 000b e47a 0100 1d8f 0000 0b3f 000b e471 000b e492 0000 000b 0000 0007 0100 253f 000b e482
0776000 000b e489 000b e49a 0000 0abf 000b e4aa 0100 1d8f 0000 2e1f 000b e4a1 000b e4ba 0100 1d8f 0000 0b3f 000b e4b1 000b e4d2
0776060 0000 0013 0000 0007 0100 253f 000b e4c2 000b e4c9 000b e4da 0000 0abf 000b e4ea 0100 1d8f 0000 2e1f 000b e4e1 000b e4fa
0776140 0100 1d8f 0000 0b3f 000b e4f1 000b e512 0000 001b 0000 0007 0100 253f 000b e502 000b e509 000b e51a 0000 0abf 000b e52a
0776220 0100 1d8f 0000 39bf 000b e521 000b e53a 0100 1d8f 0000 0b3f 000b e531 000b e552 0000 001b 0000 0007 0100 253f 000b e542
0776300 000b e549 000b e55a 0000 0abf 000b e56a 0100 1d8f 0000 2f9f 000b e561 000b e57a 0100 1d8f 0000 0b3f 000b e571 000b e592
0776360 0000 001b 0000 0007 0100 253f 000b e582 000b e589 000b e59a 0000 1797 000b e5a2 0000 0a7f 0000 0007 0300 32bf 0000 0db7
0776440 0000 2583 0000 2327 0200 0db7 000b e5a9 0000 315f 0200 0db7 000b e5d1 0000 315f 0300 32bf 0000 0db7 0000 2583 0000 2327
0776520 0000 0abf 000b db5a 000b f7da 0000 0007 0300 32bf 0000 0b3f 0000 0c83 0000 33e7 0200 0db7 000b e5f1 0000 315f 0200 0db7
0776600 000b e619 0000 315f 0300 32bf 0000 0b3f 0000 0c83 0000 33e7 0400 24f7 0000 0b3f 0000 0c83 0000 0c83 0000 0c7b 0000 0abf
0776660 000b dbaa 0200 0b3f 0000 38f7 0000 001b 0000 0abf 000b dbaa 000b e6b5 000b e6ca 0300 32bf 0000 0b3f 0000 0c83 0000 33e7
0776740 0200 0db7 000b e661 0000 315f 0200 0db7 000b e689 0000 315f 0300 32bf 0000 0b3f 0000 0c83 0000 33e7 0400 24f7 0000 0b3f
0777020 0000 0c83 0000 0c83 0000 0c7b 0000 0abf 000b dbea 0200 0b3f 0000 38ff 0000 0013 0000 0abf 000b dbea 000b e725 000b e73a
0777100 0300 32bf 0000 0b3f 0000 0c83 0000 33e7 0200 0db7 000b e6d1 0000 315f 0200 0db7 000b e6f9 0000 315f 0300 32bf 0000 0b3f
0777160 0000 0c83 0000 33e7 0400 24f7 0000 0b3f 0000 0c83 0000 0c83 0000 0c7b 0000 0abf 000b dc2a 0200 0b3f 0000 3907 0000 0013
0777240 0000 0abf 000b dc2a 000b e795 000b e7aa 0300 32bf 0000 0b3f 0000 0c83 0000 33e7 0200 0db7 000b e741 0000 315f 0200 0db7
0777320 000b e769 0000 315f 0300 32bf 0000 0b3f 0000 0c83 0000 33e7 0400 24f7 0000 0b3f 0000 0c83 0000 0c83 0000 0c7b 0000 0abf
0777400 000b dc6a 0200 0b3f 0000 390f 0000 0023 0000 0abf 000b dc6a 000b e805 000b e81a 0300 32bf 0000 0b3f 0000 0c83 0000 33e7
0777460 0200 0db7 000b e7b1 0000 315f 0200 0db7 000b e7d9 0000 315f 0300 32bf 0000 0b3f 0000 0c83 0000 33e7 0400 24f7 0000 0b3f
0777540 0000 0c83 0000 0c83 0000 0c7b 0000 0abf 000b dcaa 0200 0b3f 0000 1f07 0000 0013 0000 0abf 000b dcaa 000b e875 000b e88a
0777620 0300 32bf 0000 0b3f 0000 0c83 0000 33e7 0200 0db7 000b e821 0000 315f 0200 0db7 000b e849 0000 315f 0300 32bf 0000 0b3f
0777700 0000 0c83 0000 33e7 0400 24f7 0000 0b3f 0000 0c83 0000 0c83 0000 0c7b 0000 0abf 000b dcea 0200 0b3f 0000 3917 0000 0013
0777760 0000 0abf 000b dcea 000b e8e5 000b e8fa 0300 32bf 0000 0b3f 0000 0c83 0000 33e7 0200 0db7 000b e891 0000 315f 0200 0db7
1000040 000b e8b9 0000 315f 0300 32bf 0000 0b3f 0000 0c83 0000 33e7 0400 24f7 0000 0b3f 0000 0c83 0000 0c83 0000 0c7b 0000 0abf
1000120 000b dd2a 0200 0b3f 0000 3917 0000 001b 0000 0abf 000b dd2a 000b e955 000b e96a 0300 32bf 0000 0b3f 0000 0c83 0000 33e7
1000200 0200 0db7 000b e901 0000 315f 0200 0db7 000b e929 0000 315f 0300 32bf 0000 0b3f 0000 0c83 0000 33e7 0400 24f7 0000 0b3f
1000260 0000 0c83 0000 0c83 0000 0c7b 0000 0abf 000b dd6a 0200 0b3f 0000 391f 0000 0013 0000 0abf 000b dd6a 000b e9c5 000b e9da
1000340 0300 32bf 0000 0b3f 0000 0c83 0000 33e7 0200 0db7 000b e971 0000 315f 0200 0db7 000b e999 0000 315f 0300 32bf 0000 0b3f
1000420 0000 0c83 0000 33e7 0400 24f7 0000 0b3f 0000 0c83 0000 0c83 0000 0c7b 0000 0abf 000b ddaa 0200 0b3f 0000 3927 0000 000b
1000500 0000 0abf 000b ddaa 000b ea35 000b ea4a 0300 32bf 0000 0b3f 0000 0c83 0000 33e7 0200 0db7 000b e9e1 0000 315f 0200 0db7
1000560 000b ea09 0000 315f 0300 32bf 0000 0b3f 0000 0c83 0000 33e7 0400 24f7 0000 0b3f 0000 0c83 0000 0c83 0000 0c7b 0000 0abf
1000640 000b ddea 0200 0b3f 0000 392f 0000 001b 0000 0abf 000b ddea 000b eaa5 000b eaba 0300 32bf 0000 0b3f 0000 0c83 0000 33e7
1000720 0200 0db7 000b ea51 0000 315f 0200 0db7 000b ea79 0000 315f 0300 32bf 0000 0b3f 0000 0c83 0000 33e7 0400 24f7 0000 0b3f
1001000 0000 0c83 0000 0c83 0000 0c7b 0000 0abf 000b de2a 0200 0b3f 0000 20f7 0000 0013 0000 0abf 000b de2a 000b eb15 000b eb2a
1001060 0300 32bf 0000 0b3f 0000 0c83 0000 33e7 0200 0db7 000b eac1 0000 315f 0200 0db7 000b eae9 0000 315f 0300 32bf 0000 0b3f
1001140 0000 0c83 0000 33e7 0400 24f7 0000 0b3f 0000 0c83 0000 0c83 0000 0c7b 0000 0abf 000b de6a 0200 0b3f 0000 3937 0000 001b
1001220 0000 0abf 000b de6a 000b eb85 000b eb9a 0300 32bf 0000 0b3f 0000 0c83 0000 33e7 0200 0db7 000b eb31 0000 315f 0200 0db7
1001300 000b eb59 0000 315f 0300 32bf 0000 0b3f 0000 0c83 0000 33e7 0400 24f7 0000 0b3f 0000 0c83 0000 0c83 0000 0c7b 0000 0abf
1001360 000b deaa 0200 0b3f 0000 393f 0000 001b 0000 0abf 000b deaa 000b ebf5 000b ec0a 0300 32bf 0000 0b3f 0000 0c83 0000 33e7
1001440 0200 0db7 000b eba1 0000 315f 0200 0db7 000b ebc9 0000 315f 0300 32bf 0000 0b3f 0000 0c83 0000 33e7 0400 24f7 0000 0b3f
1001520 0000 0c83 0000 0c83 0000 0c7b 0000 0abf 000b deea 0200 0b3f 0000 2397 0000 0013 0000 0abf 000b deea 000b ec65 000b ec7a
1001600 0300 32bf 0000 0b3f 0000 0c83 0000 33e7 0200 0db7 000b ec11 0000 315f 0200 0db7 000b ec39 0000 315f 0300 32bf 0000 0b3f
1001660 0000 0c83 0000 33e7 0400 24f7 0000 0b3f 0000 0c83 0000 0c83 0000 0c7b 0000 0abf 000b df2a 0200 0b3f 0000 2397 0000 001b
1001740 0000 0abf 000b df2a 000b ecd5 000b ecea 0300 32bf 0000 0b3f 0000 0c83 0000 33e7 0200 0db7 000b ec81 0000 315f 0200 0db7
1002020 000b eca9 0000 315f 0300 32bf 0000 0b3f 0000 0c83 0000 33e7 0400 24f7 0000 0b3f 0000 0c83 0000 0c83 0000 0c7b 0000 0abf
1002100 000b df6a 0200 0b3f 0000 3947 0000 0013 0000 0abf 000b df6a 000b ed45 000b ed5a 0300 32bf 0000 0b3f 0000 0c83 0000 33e7
```

| | | | | | | | | | | | | | | | | | | | | | | | | |
|---|---|---|---|---|---|---|---|---|---|---|---|---|---|---|---|---|---|---|---|---|---|---|---|---|
| 1002160 | 0200 | 0db7 | 000b | ecf1 | 0000 | 315f | 0200 | 0db7 | 000b | ed19 | 0000 | 315f | 0300 | 32bf | 0000 | 0b3f | 0000 | 0c83 | 0000 | 33e7 | 0400 | 24f7 | 0000 | 0b3f |
| 1002240 | 0000 | 0c83 | 0000 | 0c83 | 0000 | 0c7b | 0000 | 0abf | 000b | dfaa | 0200 | 0b3f | 0000 | 394f | 0000 | 0013 | 0000 | 0abf | 000b | dfaa | 000b | edb5 | 000b | edca |
| 1002320 | 0300 | 32bf | 0000 | 0b3f | 0000 | 0c83 | 0000 | 33e7 | 0200 | 0db7 | 000b | ed61 | 0000 | 315f | 0200 | 0db7 | 000b | ed89 | 0000 | 315f | 0300 | 32bf | 0000 | 0b3f |
| 1002400 | 0000 | 0c83 | 0000 | 33e7 | 0400 | 24f7 | 0000 | 0b3f | 0000 | 0c83 | 0000 | 0c83 | 0000 | 0c7b | 0000 | 0abf | 000b | dfea | 0200 | 0b3f | 0000 | 23a7 | 0000 | 001b |
| 1002460 | 0000 | 0abf | 000b | dfea | 000b | ee25 | 000b | ee3a | 0300 | 32bf | 0000 | 0b3f | 0000 | 0c83 | 0000 | 33e7 | 0200 | 0db7 | 000b | edd1 | 0000 | 315f | 0200 | 0db7 |
| 1002540 | 000b | edf9 | 0000 | 315f | 0300 | 32bf | 0000 | 0b3f | 0000 | 0c83 | 0000 | 33e7 | 0400 | 24f7 | 0000 | 0b3f | 0000 | 0c83 | 0000 | 0c83 | 0000 | 0c7b | 0000 | 0abf |
| 1002620 | 000b | e02a | 0200 | 0b3f | 0000 | 3957 | 0000 | 0013 | 0000 | 0abf | 000b | e02a | 000b | ee95 | 000b | eeaa | 0300 | 32bf | 0000 | 0b3f | 0000 | 0c83 | 0000 | 33e7 |
| 1002700 | 0200 | 0db7 | 000b | ee41 | 0000 | 315f | 0200 | 0db7 | 000b | ee69 | 0000 | 315f | 0300 | 32bf | 0000 | 0b3f | 0000 | 0c83 | 0000 | 33e7 | 0400 | 24f7 | 0000 | 0b3f |
| 1002760 | 0000 | 0c83 | 0000 | 0c83 | 0000 | 0c7b | 0000 | 0abf | 000b | e06a | 0200 | 0b3f | 0000 | 395f | 0000 | 000b | 0000 | 0abf | 000b | e06a | 000b | ef05 | 000b | ef1a |
| 1003040 | 0300 | 32bf | 0000 | 0b3f | 0000 | 0c83 | 0000 | 33e7 | 0200 | 0db7 | 000b | eeb1 | 0000 | 315f | 0200 | 0db7 | 000b | eed9 | 0000 | 315f | 0300 | 32bf | 0000 | 0b3f |
| 1003120 | 0000 | 0c83 | 0000 | 33e7 | 0400 | 24f7 | 0000 | 0b3f | 0000 | 0c83 | 0000 | 0c83 | 0000 | 0c7b | 0000 | 0abf | 000b | e0aa | 0200 | 0b3f | 0000 | 3967 | 0000 | 0003 |
| 1003200 | 0000 | 0abf | 000b | e0aa | 000b | ef75 | 000b | ef8a | 0300 | 32bf | 0000 | 0b3f | 0000 | 0c83 | 0000 | 33e7 | 0200 | 0db7 | 000b | ef21 | 0000 | 315f | 0200 | 0db7 |
| 1003260 | 000b | ef49 | 0000 | 315f | 0300 | 32bf | 0000 | 0b3f | 0000 | 0c83 | 0000 | 33e7 | 0400 | 24f7 | 0000 | 0b3f | 0000 | 0c83 | 0000 | 0c83 | 0000 | 0c7b | 0000 | 0abf |
| 1003340 | 000b | e0ea | 0200 | 0b3f | 0000 | 396f | 0000 | 001b | 0000 | 0abf | 000b | e0ea | 000b | efe5 | 000b | effa | 0300 | 32bf | 0000 | 0b3f | 0000 | 0c83 | 0000 | 33e7 |
| 1003420 | 0200 | 0db7 | 000b | ef91 | 0000 | 315f | 0200 | 0db7 | 000b | efb9 | 0000 | 315f | 0300 | 32bf | 0000 | 0b3f | 0000 | 0c83 | 0000 | 33e7 | 0400 | 24f7 | 0000 | 0b3f |
| 1003500 | 0000 | 0c83 | 0000 | 0c83 | 0000 | 0c7b | 0000 | 0abf | 000b | e12a | 0200 | 0b3f | 0000 | 294f | 0000 | 0013 | 0000 | 0abf | 000b | e12a | 000b | f055 | 000b | f06a |
| 1003560 | 0300 | 32bf | 0000 | 0b3f | 0000 | 0c83 | 0000 | 33e7 | 0200 | 0db7 | 000b | f001 | 0000 | 315f | 0200 | 0db7 | 000b | f029 | 0000 | 315f | 0300 | 32bf | 0000 | 0b3f |
| 1003640 | 0000 | 0c83 | 0000 | 33e7 | 0400 | 24f7 | 0000 | 0b3f | 0000 | 0c83 | 0000 | 0c83 | 0000 | 0c7b | 0000 | 0abf | 000b | e16a | 0200 | 0b3f | 0000 | 294f | 0000 | 001b |
| 1003720 | 0000 | 0abf | 000b | e16a | 000b | f0c5 | 000b | f0da | 0300 | 32bf | 0000 | 0b3f | 0000 | 0c83 | 0000 | 33e7 | 0200 | 0db7 | 000b | f071 | 0000 | 315f | 0200 | 0db7 |
| 1004000 | 000b | f099 | 0000 | 315f | 0300 | 32bf | 0000 | 0b3f | 0000 | 0c83 | 0000 | 33e7 | 0400 | 24f7 | 0000 | 0b3f | 0000 | 0c83 | 0000 | 0c83 | 0000 | 0c7b | 0000 | 0abf |
| 1004060 | 000b | e1aa | 0200 | 0b3f | 0000 | 3977 | 0000 | 0013 | 0000 | 0abf | 000b | e1aa | 000b | f135 | 000b | f14a | 0300 | 32bf | 0000 | 0b3f | 0000 | 0c83 | 0000 | 33e7 |
| 1004140 | 0200 | 0db7 | 000b | f0e1 | 0000 | 315f | 0200 | 0db7 | 000b | f109 | 0000 | 315f | 0300 | 32bf | 0000 | 0b3f | 0000 | 0c83 | 0000 | 33e7 | 0400 | 24f7 | 0000 | 0b3f |
| 1004220 | 0000 | 0c83 | 0000 | 0c83 | 0000 | 0c7b | 0000 | 0abf | 000b | e1ea | 0200 | 0b3f | 0000 | 397f | 0000 | 0013 | 0000 | 0abf | 000b | e1ea | 000b | f1a5 | 000b | f1ba |
| 1004300 | 0300 | 32bf | 0000 | 0b3f | 0000 | 0c83 | 0000 | 33e7 | 0200 | 0db7 | 000b | f151 | 0000 | 315f | 0200 | 0db7 | 000b | f179 | 0000 | 315f | 0300 | 32bf | 0000 | 0b3f |
| 1004360 | 0000 | 0c83 | 0000 | 33e7 | 0400 | 24f7 | 0000 | 0b3f | 0000 | 0c83 | 0000 | 0c83 | 0000 | 0c7b | 0000 | 0abf | 000b | e22a | 0200 | 0b3f | 0000 | 3987 | 0000 | 0013 |
| 1004440 | 0000 | 0abf | 000b | e22a | 000b | f215 | 000b | f22a | 0300 | 32bf | 0000 | 0b3f | 0000 | 0c83 | 0000 | 33e7 | 0200 | 0db7 | 000b | f1c1 | 0000 | 315f | 0200 | 0db7 |
| 1004520 | 000b | f1e9 | 0000 | 315f | 0300 | 32bf | 0000 | 0b3f | 0000 | 0c83 | 0000 | 33e7 | 0400 | 24f7 | 0000 | 0b3f | 0000 | 0c83 | 0000 | 0c83 | 0000 | 0c7b | 0000 | 0abf |
| 1004600 | 000b | e26a | 0200 | 0b3f | 0000 | 3987 | 0000 | 001b | 0000 | 0abf | 000b | e26a | 000b | f285 | 000b | f29a | 0300 | 32bf | 0000 | 0b3f | 0000 | 0c83 | 0000 | 33e7 |
| 1004660 | 0200 | 0db7 | 000b | f231 | 0000 | 315f | 0200 | 0db7 | 000b | f259 | 0000 | 315f | 0300 | 32bf | 0000 | 0b3f | 0000 | 0c83 | 0000 | 33e7 | 0400 | 24f7 | 0000 | 0b3f |
| 1004740 | 0000 | 0c83 | 0000 | 0c83 | 0000 | 0c7b | 0000 | 0abf | 000b | e2aa | 0200 | 0b3f | 0000 | 398f | 0000 | 001b | 0000 | 0abf | 000b | e2aa | 000b | f2f5 | 000b | f30a |
| 1005020 | 0300 | 32bf | 0000 | 0b3f | 0000 | 0c83 | 0000 | 33e7 | 0200 | 0db7 | 000b | f2a1 | 0000 | 315f | 0200 | 0db7 | 000b | f2c9 | 0000 | 315f | 0300 | 32bf | 0000 | 0b3f |
| 1005100 | 0000 | 0c83 | 0000 | 33e7 | 0400 | 24f7 | 0000 | 0b3f | 0000 | 0c83 | 0000 | 0c83 | 0000 | 0c7b | 0000 | 0abf | 000b | e2ea | 0200 | 0b3f | 0000 | 2a77 | 0000 | 000b |
| 1005160 | 0000 | 0abf | 000b | e2ea | 000b | f365 | 000b | f37a | 0300 | 32bf | 0000 | 0b3f | 0000 | 0c83 | 0000 | 33e7 | 0200 | 0db7 | 000b | f311 | 0000 | 315f | 0200 | 0db7 |
| 1005240 | 000b | f339 | 0000 | 315f | 0300 | 32bf | 0000 | 0b3f | 0000 | 0c83 | 0000 | 33e7 | 0400 | 24f7 | 0000 | 0b3f | 0000 | 0c83 | 0000 | 0c83 | 0000 | 0c7b | 0000 | 0abf |
| 1005320 | 000b | e32a | 0200 | 0b3f | 0000 | 38c7 | 0000 | 0003 | 0000 | 0abf | 000b | e32a | 000b | f3d5 | 000b | f3ea | 0300 | 32bf | 0000 | 0b3f | 0000 | 0c83 | 0000 | 33e7 |
| 1005400 | 0200 | 0db7 | 000b | f381 | 0000 | 315f | 0200 | 0db7 | 000b | f3a9 | 0000 | 315f | 0300 | 32bf | 0000 | 0b3f | 0000 | 0c83 | 0000 | 33e7 | 0400 | 24f7 | 0000 | 0b3f |
| 1005460 | 0000 | 0c83 | 0000 | 0c83 | 0000 | 0c7b | 0000 | 0abf | 000b | e36a | 0200 | 0b3f | 0000 | 3997 | 0000 | 001b | 0000 | 0abf | 000b | e36a | 000b | f445 | 000b | f45a |
| 1005540 | 0300 | 32bf | 0000 | 0b3f | 0000 | 0c83 | 0000 | 33e7 | 0200 | 0db7 | 000b | f3f1 | 0000 | 315f | 0200 | 0db7 | 000b | f419 | 0000 | 315f | 0300 | 32bf | 0000 | 0b3f |
| 1005620 | 0000 | 0c83 | 0000 | 33e7 | 0400 | 24f7 | 0000 | 0b3f | 0000 | 0c83 | 0000 | 0c83 | 0000 | 0c7b | 0000 | 0abf | 000b | e3aa | 0200 | 0b3f | 0000 | 399f | 0000 | 000b |
| 1005700 | 0000 | 0abf | 000b | e3aa | 000b | f4b5 | 000b | f4ca | 0300 | 32bf | 0000 | 0b3f | 0000 | 0c83 | 0000 | 33e7 | 0200 | 0db7 | 000b | f461 | 0000 | 315f | 0200 | 0db7 |
| 1005760 | 000b | f489 | 0000 | 315f | 0300 | 32bf | 0000 | 0b3f | 0000 | 0c83 | 0000 | 33e7 | 0400 | 24f7 | 0000 | 0b3f | 0000 | 0c83 | 0000 | 0c83 | 0000 | 0c7b | 0000 | 0abf |
| 1006040 | 000b | e3ea | 0200 | 0b3f | 0000 | 399f | 0000 | 0013 | 0000 | 0abf | 000b | e3ea | 000b | f525 | 000b | f53a | 0300 | 32bf | 0000 | 0b3f | 0000 | 0c83 | 0000 | 33e7 |
| 1006120 | 0200 | 0db7 | 000b | f4d1 | 0000 | 315f | 0200 | 0db7 | 000b | f4f9 | 0000 | 315f | 0300 | 32bf | 0000 | 0b3f | 0000 | 0c83 | 0000 | 33e7 | 0400 | 24f7 | 0000 | 0b3f |
| 1006200 | 0000 | 0c83 | 0000 | 0c83 | 0000 | 0c7b | 0000 | 0abf | 000b | e42a | 0200 | 0b3f | 0000 | 39a7 | 0000 | 000b | 0000 | 0abf | 000b | e42a | 000b | f595 | 000b | f5aa |
| 1006260 | 0300 | 32bf | 0000 | 0b3f | 0000 | 0c83 | 0000 | 33e7 | 0200 | 0db7 | 000b | f541 | 0000 | 315f | 0200 | 0db7 | 000b | f569 | 0000 | 315f | 0300 | 32bf | 0000 | 0b3f |
| 1006340 | 0000 | 0c83 | 0000 | 33e7 | 0400 | 24f7 | 0000 | 0b3f | 0000 | 0c83 | 0000 | 0c83 | 0000 | 0c7b | 0000 | 0abf | 000b | e46a | 0200 | 0b3f | 0000 | 39af | 0000 | 000b |
| 1006420 | 0000 | 0abf | 000b | e46a | 000b | f605 | 000b | f61a | 0300 | 32bf | 0000 | 0b3f | 0000 | 0c83 | 0000 | 33e7 | 0200 | 0db7 | 000b | f5b1 | 0000 | 315f | 0200 | 0db7 |
| 1006500 | 000b | f5d9 | 0000 | 315f | 0300 | 32bf | 0000 | 0b3f | 0000 | 0c83 | 0000 | 33e7 | 0400 | 24f7 | 0000 | 0b3f | 0000 | 0c83 | 0000 | 0c83 | 0000 | 0c7b | 0000 | 0abf |
| 1006560 | 000b | e4aa | 0200 | 0b3f | 0000 | 39b7 | 0000 | 000b | 0000 | 0abf | 000b | e4aa | 000b | f675 | 000b | f68a | 0300 | 32bf | 0000 | 0b3f | 0000 | 0c83 | 0000 | 33e7 |
| 1006640 | 0200 | 0db7 | 000b | f621 | 0000 | 315f | 0200 | 0db7 | 000b | f649 | 0000 | 315f | 0300 | 32bf | 0000 | 0b3f | 0000 | 0c83 | 0000 | 33e7 | 0400 | 24f7 | 0000 | 0b3f |
| 1006720 | 0000 | 0c83 | 0000 | 0c83 | 0000 | 0c7b | 0000 | 0abf | 000b | e4ea | 0200 | 0b3f | 0000 | 2e1f | 0000 | 0013 | 0000 | 0abf | 000b | e4ea | 000b | f6e5 | 000b | f6fa |
| 1007000 | 0300 | 32bf | 0000 | 0b3f | 0000 | 0c83 | 0000 | 33e7 | 0200 | 0db7 | 000b | f691 | 0000 | 315f | 0200 | 0db7 | 000b | f6b9 | 0000 | 315f | 0300 | 32bf | 0000 | 0b3f |
| 1007060 | 0000 | 0c83 | 0000 | 33e7 | 0400 | 24f7 | 0000 | 0b3f | 0000 | 0c83 | 0000 | 0c83 | 0000 | 0c7b | 0000 | 0abf | 000b | e52a | 0200 | 0b3f | 0000 | 2e1f | 0000 | 001b |
| 1007140 | 0000 | 0abf | 000b | e52a | 000b | f755 | 000b | f76a | 0300 | 32bf | 0000 | 0b3f | 0000 | 0c83 | 0000 | 33e7 | 0200 | 0db7 | 000b | f701 | 0000 | 315f | 0200 | 0db7 |
| 1007220 | 000b | f729 | 0000 | 315f | 0300 | 32bf | 0000 | 0b3f | 0000 | 0c83 | 0000 | 33e7 | 0400 | 24f7 | 0000 | 0b3f | 0000 | 0c83 | 0000 | 0c83 | 0000 | 0c7b | 0000 | 0abf |

```
1007300  000b e56a 0200 0b3f 0000 39bf 0000 001b 0000 0abf 000b e56a 000b f7c5 0000 0007 0300 32bf 0000 0b3f 0000 0c83 0000 33e7
1007360  0200 0db7 000b f771 0000 315f 0200 0db7 000b f799 0000 315f 0300 32bf 0000 0b3f 0000 0c83 0000 33e7 0400 24f7 0000 0b3f
1007440  0000 0c83 0000 0c83 0000 0c7b 0000 1797 000b e5a2 0200 0b3f 0000 2f9f 0000 001b 0000 1797 000b e5a2 000b e645 000b e65a
1007520  0000 0a7f 0000 0007 0000 38c7 000b e5ea 0000 2827 000b f7ea 0200 2827 0000 38c7 000b f7da 0100 0db7 000b f7f9 0200 224f
1007600  0000 38df 000b f814 0200 270f 0000 38df 000b f820 0200 270f 0000 38df 0000 38c7 0200 0ad7 0000 0057 0000 0007 0200 0db7
1007660  000b f825 0000 315f 0056 8b63 0100 2167 0056 8b63 000b f854 000b f858 0400 242f 000b f860 000b f864 0000 38c7 0000 21cf
1007740  0400 242f 000b f874 000b f878 0000 38c7 0000 2f97 0200 284f 0000 38c7 000b f88c 0100 2947 0000 38c7 0200 24bf 0000 38c7
1010020  000b f8a0 0400 24af 000b f8a8 000b f8ac 0000 38c7 000b f8b4 0400 2eb7 000b f8bc 000b f8c0 0000 38c7 000b f8c8 0200 2857
1010100  000b f8d0 0000 38c7 0200 224f 000b f8dc 0000 38c7 0200 284f 0000 38c7 0000 38df 0200 0ad7 0000 004f 0000 0007 0200 0db7
1010160  000b f8e5 0000 315f 003e fea3 0100 2167 003e fea3 0200 2827 0000 38c7 000b f7da 0051 2543 0400 242f 0000 38f7 0000 001b
1010240  0000 38c7 0000 21cf 0200 0ad7 0000 004f 0000 0007 0200 0db7 000b f925 0000 315f 003d 3fc3 0100 2167 003d 3fc3 0058 d2a3
1010320  0400 242f 0000 38ff 0000 0013 0000 38c7 0000 21cf 0200 0ad7 0000 004f 0000 0007 0200 0db7 000b f961 0000 315f 003d 3fc3
1010400  0100 2167 003d 3fc3 0058 f463 0400 242f 0000 3907 0000 0013 0000 38c7 0000 21cf 0200 0ad7 0000 004f 0000 0007 0200 0db7
1010460  000b f99d 0000 315f 003d 3fc3 0100 2167 003d 3fc3 0058 f623 0400 242f 0000 390f 0000 0023 0000 38c7 0000 21cf 0200 0ad7
1010540  0000 004f 0000 0007 0200 0db7 000b f949 0000 315f 003d 3fc3 0100 2167 003d 3fc3 0056 aae3 0400 242f 0000 1f87 0000 0013
1010620  0000 38c7 0000 21cf 0200 0ad7 0000 004f 0000 0007 0200 0db7 000b fa15 0000 315f 003d 3fc3 0100 2167 003d 3fc3 0056 ae03
1010700  0400 242f 0000 3917 0000 0013 0000 38c7 0000 21cf 0200 0ad7 0000 004f 0000 0007 0200 0db7 000b fa51 0000 315f 003d 3fc3
1010760  0100 2167 003d 3fc3 0056 b163 0400 242f 0000 3917 0000 001b 0000 38c7 0000 21cf 0200 0ad7 0000 004f 0000 0007 0200 0db7
1011040  000b fa8d 0000 315f 003d 3fc3 0100 2167 003d 3fc3 0056 b463 0400 242f 0000 391f 0000 0013 0000 38c7 0000 21cf 0200 0ad7
1011120  0000 004f 0000 0007 0200 0db7 000b fac9 0000 315f 003d 3fc3 0100 2167 003d 3fc3 0056 b803 0400 242f 0000 3927 0000 000b
1011200  0000 38c7 0000 21cf 0200 0ad7 0000 004f 0000 0007 0200 0db7 000b fb05 0000 315f 003d 3fc3 0100 2167 003d 3fc3 0056 bba3
1011260  0400 242f 0000 392f 0000 001b 0000 38c7 0000 21cf 0200 0ad7 0000 004f 0000 0007 0200 0db7 000b fb41 0000 315f 003d 3fc3
1011340  0100 2167 003d 3fc3 0056 bec3 0400 242f 0000 2ff7 0000 0013 0000 38c7 0000 21cf 0200 0ad7 0000 004f 0000 0007 0200 0db7
1011420  000b fb7d 0000 315f 003d 3fc3 0100 2167 003d 3fc3 0056 c1c3 0400 242f 0000 3937 0000 001b 0000 38c7 0000 21cf 0200 0ad7
1011500  0000 004f 0000 0007 0200 0db7 000b fbb9 0000 315f 003d 3fc3 0100 2167 003d 3fc3 0056 c4e3 0400 242f 0000 393f 0000 001b
1011560  0000 38c7 0000 21cf 0200 0ad7 0000 004f 0000 0007 0200 0db7 000b fbf5 0000 315f 003d 3fc3 0100 2167 003d 3fc3 0056 c803
1011640  0400 242f 0000 2397 0000 0013 0000 38c7 0000 21cf 0200 0ad7 0000 004f 0000 0007 0200 0db7 000b fc31 0000 315f 003d 3fc3
1011720  0100 2167 003d 3fc3 0056 cb23 0400 242f 0000 2397 0000 001b 0000 38c7 0000 21cf 0200 0ad7 0000 004f 0000 0007 0200 0db7
1012000  000b fc6d 0000 315f 003d 3fc3 0100 2167 003d 3fc3 0056 ce23 0400 242f 0000 3947 0000 0013 0000 38c7 0000 21cf 0200 0ad7
1012060  0000 004f 0000 0007 0200 0db7 000b fca9 0000 315f 003d 3fc3 0100 2167 003d 3fc3 0056 d143 0400 242f 0000 394f 0000 0013
1012140  0000 38c7 0000 21cf 0200 0ad7 0000 004f 0000 0007 0200 0db7 000b fce5 0000 315f 003d 3fc3 0100 2167 003d 3fc3 0056 d4e3
1012220  0400 242f 0000 23a7 0000 001b 0000 38c7 0000 21cf 0200 0ad7 0000 004f 0000 0007 0200 0db7 000b fd21 0000 315f 003d 3fc3
1012300  0100 2167 003d 3fc3 0056 d7e3 0400 242f 0000 3957 0000 0013 0000 38c7 0000 21cf 0200 0ad7 0000 004f 0000 0007 0200 0db7
1012360  000b fd5d 0000 315f 003d 3fc3 0100 2167 003d 3fc3 0056 db83 0400 242f 0000 395f 0000 000b 0000 38c7 0000 21cf 0200 0ad7
1012440  0000 004f 0000 0007 0200 0db7 000b fd99 0000 315f 003d 3fc3 0100 2167 003d 3fc3 0056 df23 0400 242f 0000 3967 0000 0003
1012520  0000 38c7 0000 21cf 0200 0ad7 0000 004f 0000 0007 0200 0db7 000b fdd5 0000 315f 003d 3fc3 0100 2167 003d 3fc3 0056 e243
1012600  0400 242f 0000 396f 0000 001b 0000 38c7 0000 21cf 0200 0ad7 0000 004f 0000 0007 0200 0db7 000b fe11 0000 315f 003d 3fc3
1012660  0100 2167 003d 3fc3 0056 e5e3 0400 242f 0000 294f 0000 0013 0000 38c7 0000 21cf 0200 0ad7 0000 004f 0000 0007 0200 0db7
1012740  000b fe4d 0000 315f 003d 3fc3 0100 2167 003d 3fc3 0056 e8e3 0400 242f 0000 294f 0000 001b 0000 38c7 0000 21cf 0200 0ad7
1013020  0000 004f 0000 0007 0200 0db7 000b fe89 0000 315f 003d 3fc3 0100 2167 003d 3fc3 0056 ebe3 0400 242f 0000 3977 0000 0013
1013100  0000 38c7 0000 21cf 0200 0ad7 0000 004f 0000 0007 0200 0db7 000b fec5 0000 315f 003d 3fc3 0100 2167 003d 3fc3 0056 ef83
1013160  0400 242f 0000 397f 0000 0013 0000 38c7 0000 21cf 0200 0ad7 0000 004f 0000 0007 0200 0db7 000b ff01 0000 315f 003d 3fc3
1013240  0100 2167 003d 3fc3 0056 f2a3 0400 242f 0000 3987 0000 0013 0000 38c7 0000 21cf 0200 0ad7 0000 004f 0000 0007 0200 0db7
1013320  000b ff3d 0000 315f 003d 3fc3 0100 2167 003d 3fc3 0056 f643 0400 242f 0000 3987 0000 001b 0000 38c7 0000 21cf 0200 0ad7
1013400  0000 004f 0000 0007 0200 0db7 000b ff79 0000 315f 003d 3fc3 0100 2167 003d 3fc3 0056 f943 0400 242f 0000 398f 0000 001b
1013460  0000 38c7 0000 21cf 0200 0ad7 0000 004f 0000 0007 0200 0db7 000b ffb5 0000 315f 003d 3fc3 0100 2167 003d 3fc3 0056 fc63
1013540  0400 242f 0000 2a77 0000 000b 0000 38c7 0000 21cf 0200 0ad7 0000 004f 0000 0007 0200 0db7 000b fff1 0000 315f 003d 3fc3
1013620  0100 2167 003d 3fc3 0056 ff53 0400 242f 0000 38c7 0000 0003 0000 38c7 0000 21cf 0200 0ad7 0000 004f 0000 0007 0000 3b2f
1013700  b328 002d 000b 910c 0000 0000 0000 3b37 b328 3fc3 000b 9140 0000 0000 0000 3c37 b328 001b 000b 9174 0000 0000 000a 1cac
1013760  0000 0000 000c 036c 000c 007c 0000 3aaf b328 315f 000b 91a4 0000 0000 0000 3c3f b328 05e3 000b 91d4 0000 0000 000a 1cbc
1014040  0000 0000 000c 009c 000c 00ac 0000 3c47 b328 0007 000b 9204 0000 0000 000a 1ccc 0000 0000 000c 00bc 000c 00cc 0000 3c4f
1014120  b328 242f 000b 9234 0000 0000 000a aac8 0000 0000 000c 00dc 000c 00ec 0000 3c57 b328 0db7 000b 9264 0000 0000 000a 1cdc
1014200  0000 0000 000c 00fc 000c 010c 0000 3b2f b328 39a7 000b 9294 0000 0000 0000 3b37 b328 0ad7 000b 92c4 0000 0000 001f 2240
1014260  2823 2938 392f 3037 2f31 3320 6672 6f6d 6f6e 746f 2e70 6c09 3332 2e31 2200 39af 000b ad70 0100 2def 0000 3aa7 0000 0004
1014340  000c 01d0 000c 01d0 0001 004c 0000 0000 0000 3fcf b328 0010 000a fef0 0000 0000 0000 0028 000b ada8 b27c b66c 0000 012e
```

```
1014420  7fff ffff 000c 0334 0200 0db5 0100 32b5 0000 3aa7 0000 315f 0000 3aa7 b328 315f 000c 019c 0000 0000 000c 01b8 000a 1ea4
1014500  2cac 242f 0002 438a 2ca0 0013 0000 0000 0000 0001 000b d41c 000b d41c 0002 438a 000c 01f4 000b d428 0000 38c7 b328 0000
1014560  000c 04d0 0000 0000 000a 271c 0000 0000 0005 5170 466c 7400 0005 5170 496e 7400 2c78 0010 0002 438a 239c 0000 000c 887c
1014640  000d 6f62 6a65 6374 5f65 7869 7374 7300 0000 39cf b328 1b63 000c 0338 0000 0000 0000 23a7 b328 0000 000a 2630 0000 0000
1014720  000c 4180 0100 3e87 0000 3287 0000 0004 000c 4bbc 000c 4bbc 0041 0000 0000 0000 2c78 0010 0002 438a 239c 0000 000b ac54
1015000  0000 2e1f b328 21cf 000b b4fc 0000 0000 2c78 0010 0002 438a 239c 0000 000b acd4 0000 3aaf b328 2167 000b b448 0000 0000
1015060  000b 6672 6f6d 6f6e 746f 2e70 6c00 0000 27f0 0018 000c 030c 4e1c 0000 0000 0007 239c 0000 0008 d13c 2cac 02e8 0002 438a
1015140  2ca0 02f0 0000 0000 0000 0001 030c 02d0 000c 030c 000c 0316 000a eb5c 2954 001c 0002 438a 56f8 671c 682c 247c 0008 ec1c
1015220  0010 2340 000b dfb4 000c 0368 0000 0028 000c 0198 b27c b66c 0000 0149 7fff ffff 000c 04cc 0200 0db5 0100 32b5 0000 39cf
1015300  0000 315f 000c 0b30 000c 0aec 2938 001a 000b ba28 4e1c 0000 0000 06df 4e70 0000 0000 06df 2edc 1d8f 27f0 398f 000b ba28
1015360  2ca0 0386 0000 0000 0000 0001 000c 035c 000b ba28 0002 438a 000c 0328 0015 6368 6172 735f 746f 5f74 6572 6d5f 6f72 5f61
1015440  746f 6d00 0008 b02c 020c 3c7f 0000 39cf 0000 0008 000b bbfc 000b 8dbc 0001 0049 0000 0000 2c78 0020 0002 438a 2520 4754
1015520  33a0 247c 0008 c1fc 0014 37f0 3cf4 234c 000b 6700 0005 636c 6561 6e00 2c78 0024 0002 438a 45b8 46ec 3588 3348 24d0 0000
1015600  000b 66d0 0018 3d6c 2410 0000 0008 dd7c 0000 3fc7 b328 0010 000a febc 0000 0000 0008 d86c 0100 3ca7 0000 38c7 0000 0004
1015660  000b 624c 000c 13f4 0001 0047 0000 0000 001e 2c2c 2e20 272c 272c 6169 7475 6161 2c61 6974 7561 612c 6169 7475 6161 2e20
1015740  0000 0e3f 0002 2a2f 0000 0abf 000c 7465 726d 5f61 746f 6d2e 706c 0000 0004 7469 6d65 0000 0011 6e65 775f 746f 6f5f 6d61
1016020  6e79 5f76 6172 7300 000d 9520 0000 0000 000c 0420 000c 04b8 000a 4578 0000 0000 000b 1e10 0000 0028 000c 0334 b27c b66c
1016100  0000 015d 7fff ffff 000c 4530 0200 0db5 0100 32b5 0000 38c7 0000 315f 2c78 001c 0002 438a 2520 42ac 0000 2a77 000c 0440
1016160  000c 234c 000a dbe4 2c78 0018 0002 438a 3690 4538 6c08 5370 239c 0000 000a dec8 0004 6475 6d70 0000 2c78 0024 0002 438a
1016240  45c4 4700 3310 39f8 000c 055c 0018 386c 37f0 3cf4 242c 0000 000a dec8 ffff ffff 0200 230f 0000 38c7 0000 0008 000c 105c
1016320  000c 105c 0001 0047 0000 0000 000b 6780 0200 2a77 0000 38c7 0000 0008 000c 0644 000c 0654 0001 0047 0000 0000 0008 e90c
1016400  0200 218f 0000 38c7 0000 0008 000c 144c 000c 1524 0001 0047 0000 0000 27f0 05ac 000c 05f0 2ca0 05b4 0000 0000 0000 0001
1016460  000b 4878 000c 05f0 000b 491a 000c 04c0 ffff ffff 0200 3cbf 0000 38c7 0000 0008 000b 634c 000b 634c 0001 0047 0000 0000
1016540  2954 0024 0002 438a 3574 43e4 0200 3987 6b48 6bc8 4240 0000 0000 3cc7 239c 0000 000c 059c 0000 3fbf b328 0010 000a fe88
1016620  0000 0000 27f0 0010 000c 0634 239c 0000 000a e0bc 2954 0010 0002 438a 239c 0000 0008 d31c 27f0 0010 000c 0654 239c 0000
1016700  000a e120 2954 0010 0002 438a 239c 0000 0008 d35c 000c 7072 6f74 616c 6b5f 7365 6e64 00b7 0000 3fb7 b464 0010 000a d440
1016760  000a d468 0008 d98c 0300 3cef 0000 38c7 0000 000c 000b 62cc 000b 62cc 0001 0047 0000 0000 0008 d8cc 0200 3ccf 0000 38c7
1017040  0000 0008 000b 4a4c 000b 4a4c 0001 0047 0000 0000 0005 6361 6c6c 3200 0013 362c 000b 42dc 0004 6269 7473 0000 0008 d92c
1017120  0300 3cdf 0000 38c7 0000 000c 000c 0774 000c 0774 0001 0047 0000 0000 000c 06a4 0300 3ccf 0000 38c7 0000 000c 000b 4b1c
1017200  000b 4b1c 0001 0047 0000 0000 0005 6361 6c6c 3300 0008 d94c 0400 3ce7 0000 38c7 0000 0010 000c 07ac 000c 07ac 0001 0047
1017260  0000 0000 2c78 0010 0002 438a 239c 0000 000c 889c 2c78 0010 0002 438a 239c 0000 000c 88bc 0000 3e1f b328 0010 000a e624
1017340  0000 0000 2cac 1d8f 0002 438a 2ca0 0775 0000 0000 0000 0001 000b 4bec 000b 4bec 0002 438a 000c 0798 000b 4bf8 2c78 0010
1017420  0002 438a 239c 0000 000c 88dc 2cac 0abf 0002 438a 2ca0 1d8f 0000 0000 0000 0001 000b 4cb8 000b 4cb8 0002 438a 000c 07d0
1017500  000b 4cc4 2c78 0010 0002 438a 239c 0000 000c 88fc 2c78 0014 0002 438a 5d10 0000 0100 0e4f 5fa0 7220 2cac 07fe 0002 438a
1017560  2ca0 0806 0000 0000 0000 0001 000c 07e4 000c 07e4 0002 438a 000c 081c 000c 07f0 2c78 0010 0002 438a 239c 0000 000c 891c
1017640  2c78 0010 0002 438a 239c 0000 000c 8a58 27f0 001c 000b 4e08 45b8 39a4 000c 086c 0010 2ecc 2420 0000 000a db70 0008 c3ec
1017720  0100 240f 0000 38c7 0000 0004 000c 1018 000c 1018 0001 0047 0000 0000 0008 d9ac 0100 3cf7 0000 38c7 0000 0004 000b 4f50
1020000  000b 4f50 0001 0047 0000 0000 0008 d9cc 0100 3cff 0000 38c7 0000 0004 000b 5dd8 000b 5dd8 0001 0047 0000 0000 0008 d9ec
1020060  0500 3d07 0000 38c7 0000 0014 000b 506c 000b 506c 0001 0047 0000 0000 0004 7365 6c66 0007 0000 3e7f b328 0010 000a a538
1020140  0000 0000 0010 9370 000c 0d64 0004 6261 7365 0000 2c78 0010 0002 438a 239c 0000 000c 893c 0005 616c 7068 6100 0003 666f
1020220  7200 0000 2c78 0028 0002 438a 2520 34c0 0018 3244 3228 320c 24d0 0000 000c 08cc 0010 4064 000c 08ac 000c 2eb0 000b 8838
1020300  0100 3d17 0000 38c7 0000 0004 000b 4ffc 000b 4ffc 0001 0047 0000 0000 000b 7265 6e61 6d65 5f66 696c 6500 0000 000a 6f62
1020360  6a65 6374 6966 7931 0000 0003 000a 6f62 6a65 6374 6966 7932 0000 38c7 000c 6465 6331 305f 7265 6e61 6d65 0000 000c 48ac
1020440  000c 09b4 000c 4394 000c 0ec0 0008 da4c 0500 3d1f 0000 38c7 0000 0014 000b 5168 000b 5168 0001 0047 0000 0000 0008 da6c
1020520  0500 3d27 0000 38c7 0000 0014 000b 521c 000b 521c 0001 0047 0000 0000 0000 3e0f b328 2857 000c 4534 0000 0000 0008 b1ac
1020600  0300 3d2f 0000 38c7 0000 000c 000c 0a60 000b 528c 0001 0047 0000 0000 000b 6669 6c65 5f65 7869 7374 7300 0000 0000 3f47
1020660  b328 0daf 000a fda0 0000 0000 2938 0012 000b 528c 4e1c 0000 0000 0003 2edc eee3 27f0 0ae5 000b 528c 2ca0 2177 0000 0000
1020740  0000 0001 000c 0a4c 000b 528c 0002 438a 000c 0a84 000c 0a58 0000 3e87 b328 315f 000a f858 0000 0000 2c78 0028 0002 438a
1021020  45b8 46ec 3b4c 0000 000a e0bc 0014 3858 37dc 41d4 0000 1f87 242c 0000 000a d838 0000 3f3f b328 04b7 000a fd6c 0000 0000
1021100  0000 3f2f b328 0add 000a fd04 0000 0000 2938 001c 000c 0b24 4e1c 0000 0000 251f 3574 35ec 3050 22bc 000a da28 27f0 eee3
1021160  000c 0b40 2ca0 242f 0000 0004 0000 0002 000c 0ae0 000c 0b40 0002 438a 000c 0354 000c 0f14 28c4 001c 000c 0b40 4e1c 0000
1021240  0000 3d37 3574 35ec 239c 0000 000c 057c 2954 0010 0002 438a 239c 0000 000a d62c 0000 3f37 b328 001f 000a fd38 0000 0000
1021320  2c78 0024 0002 438a 45c4 33a0 4300 0000 0000 3917 000a d838 0014 37f0 3cf4 234c 000a e2ac b464 de68 000a fff4 0000 0000
1021400  2c78 0028 0002 438a 45c4 4768 33a0 42ac 0000 3917 000a d838 0018 386c 37f0 3cf4 242c 0000 000a e30c 0004 7368 6f77 0007
1021460  0003 203a 2000 08ad b464 0b88 000a ff8c 0000 0000 27f0 378f 000c 0d38 2ca0 2257 0000 000c 0000 0003 000b 5464 000c 0d38
```

```
1021540  0002 438a 000c 0cc4 28c4 0012 000b 54c4 4e1c 0000 0000 3d3f 228c 0be4 2b24 095f 0002 438a 000c 0c08 0000 3d3f 29c8 0c08
1021620  000c 0c0c 000b 5474 0004 7669 6577 00ff 000e 6173 736f 6369 6174 655f 7669 6577 000c 0c25 0004 7369 7a65 000b 0005 636c
1021700  6561 7200 0008 b26c 0200 3d57 0300 38c7 0000 0008 000c 15b4 000b 65ec 0001 0047 0000 0000 000b 54d0 0000 0000 000c 0d28
1021760  000c 0c74 000c 11dc 0000 0000 0013 7669 6577 5f77 6974 685f 6465 6c65 6761 7465 7300 0007 0008 db2c 0100 3d6f 0000 38c7
1022040  0000 0004 000a 18f0 000a 18f0 0000 0000 0000 0000 0000 0000 000c 0c74 0000 0000 000c 0c18 000b 7669 6577 5f6f 626a 6563
1022120  7400 0c9e 28c4 0018 000c 0d38 4e1c 0000 0000 3d6f 3574 22bc 000c 0d0c 0008 db4c 0100 3d77 0000 38c7 0000 0004 000a 18f0
1022200  000a 18f0 0000 0000 0000 0000 2b24 378f 0002 438a 000c 0cf4 0000 3d6f 29c8 0343 000c 0d1c 000b 5544 2954 0010 0002 438a
1022260  239c 0000 000a d5c0 0008 7465 6d70 6c61 7465 0056 0000 3f27 b328 0d5e 000a fcd0 0000 0000 0010 e350 000a 20dc 0012 696e
1022340  6974 6961 6c69 7a65 5f6d 6574 686f 6473 000c 0d86 0000 3f1f b328 0d8e 000a fc9c 0000 0000 2c78 001c 0002 438a 45c4 46d8
1022420  37dc 39f8 000a d7c4 0014 2330 000c 0dc0 0008 db8c 0200 3d87 0000 38c7 0000 0008 000b 61e4 000c 13d8 0001 0047 0000 0000
1022500  0000 3f17 b328 0343 000a fc68 0000 0000 0000 3f0f b328 036b 000a fc34 0000 0000 0000 3f07 b328 017b 000a fc00 0000 0000
1022560  000c 4a50 000a 3268 000c 0a3c 000c 12d4 0000 3eff b328 039b 000a fbcc 0000 0000 0000 3ef7 b328 017b 000a fb98 0000 0000
1022640  000c 4a88 000c 15ac 000a 3244 0000 0000 0000 3eef b328 03ab 000a fb64 0000 0000 000a 4488 0000 0000 000a 44e8 0000 0000
1022720  0000 3ee7 b328 03ab 000a fb30 0000 0000 0010 a64c 0000 0000 000a 44c8 0000 0000 0000 3edf b328 033b 000a fafc 0000 0000
1023000  0000 3ed7 b328 0373 000a fac8 0000 0000 0000 3ecf b328 0393 000a fa94 0000 0000 0000 3ec7 b328 031b 000a fa60 0000 0000
1023060  000c 487c 0000 0000 0005 7261 6e67 6500 0000 3ebf b464 0363 000a f9c4 000c 1fe0 27f0 0018 000b 5c5c 5758 6750 5370 3050
1023140  239c 0000 000a e30c 0000 3eb7 b328 01ab 000a f990 0000 0000 27f0 0014 000c 0f40 4e1c 0000 0000 0007 54f8 228c 2cac 032b
1023220  0002 438a 2ca0 0393 0000 0000 0300 0001 000c 0f08 000c 0f40 000c 0f4a 000c 0b20 2954 0028 0002 438a 56f8 671c 682c 46ec
1023300  57b8 6784 6a50 37f0 24d0 0000 000a d838 0018 231c 000a dc48 0006 6d73 746f 7265 000c 0f76 0008 dbac 0300 3d8f 0000 38c7
1023360  0000 000c 000c 0fb8 000c 0fb8 0001 0047 0000 0000 0000 3eaf b328 0007 000a f95c 0000 0000 27f0 0014 000c 0fe0 4e1c 0000
1023440  0000 0007 54f8 228c 2cac 0fbe 0002 438a 2ca0 0fc6 0000 0000 0000 0001 000c 0fa4 000c 0fe0 000c 0fea 000c 0fdc 000c 0fb0
1023520  2954 0028 0002 438a 56f8 671c 682c 46ec 57b8 6784 6a50 37f0 24d0 0000 000a e3e0 0018 231c 000c 0f84 0000 3ea7 b328 378f
1023600  000a f928 0000 0000 2c78 0022 0002 438a 2520 3310 24d0 0000 000c 055c 0010 3cf4 4e1c 0000 0000 0007 723c 103e 0000 3e9f
1023660  b328 1046 000a f8f4 0000 0000 0004 656c 7365 0000 000c 0f94 000a 3564 2c78 0014 0002 438a 3640 4368 239c 0000 000c 1080
1023740  000c 054c 0300 230f 0000 38c7 0000 000c 000c 109c 000c 1110 0001 0047 0000 0000 0008 6973 5f75 7070 6572 0000 27f0 0014
1024020  000c 10b0 57b8 6b48 6b88 9294 936c 2edc 28c4 0010 000c 10e8 4960 9294 97ac 2edc 2938 0028 000c 1110 56f8 682c 671c 4768
1024100  3050 33bc 24d0 0000 000c 1080 0018 386c 3d30 2340 000c 1080 28c4 10ee 000c 1110 2ca0 10f6 0000 0000 0000 0000 000c 10c0
1024160  000c 1110 000c 10ca 000c 110c 0000 0000 2954 0028 0002 438a 2520 46ec 4768 3310 24d0 0000 0008 ad7c 0018 386c 37f0 3cf4
1024240  242c 0000 000c 1080 0000 3e97 b328 031b 000a f8c0 0000 0000 000a 3228 0000 0000 0005 756e 7469 6c00 0000 3e8f b328 0363
1024320  000a f88c 0000 0000 000a d54c 0300 1f87 0000 38c7 0000 000c 000c 1194 000c 1194 0001 0047 0000 0000 0008 6973 5f6c 6973
1024400  745f 00fc 2c78 0010 0002 438a 239c 0000 000a d964 0014 6174 7461 6368 5f6d 6f64 756c 655f 7072 6566 6978 00be 0008 dbcc
1024460  0200 3d97 0000 38c7 0000 0008 000c 1214 000c 123c 0001 0047 0000 0000 0000 3e0f b328 11e6 000a f82c 0000 0000 0004 626f
1024540  6479 0000 2938 001e 000c 123c 5d10 0000 0200 01af 62c0 5b58 0200 0daf 6bf4 6b74 2edc 1216 27f0 030b 000c 123c 2ca0 0363
1024620  0000 0000 0000 0001 000c 11f4 000c 123c 0002 438a 000c 1238 000c 1200 2954 001c 0002 438a 5d7c 0000 0200 0daf 4b8c 0000
1024700  0000 3287 6b48 229c 0000 3e3f b328 017b 000a f7c0 0000 0000 0018 696e 6865 7269 745f 696e 7374 616e 6365 5f6d 6574 686f
1024760  6473 0086 0000 3e3f b328 128e 000a f794 0000 0000 0010 aee8 000f 82d8 000c 1008 000a 3220 0008 dbec 0200 3d9f 0000 38c7
1025040  0000 0008 000c 12f0 000c 133c 0001 0047 0000 0000 000a 6973 5f6e 6577 7061 6765 0000 0000 000a 44f8 0000 0000 2938 0012
1025120  000c 1318 4e1c 0000 0000 0007 2edc 03a3 27f0 12f6 000b 6078 2ca0 12fe 0000 0000 0000 0001 000c 12dc 000b 6078 000c 1322
1025200  000c 1314 000c 12e8 28c4 0024 000b 6078 56f8 671c 682c 46ec 3050 37f0 24d0 0000 000c 12b4 0014 2330 000c 12b4 2954 000a
1025260  0002 438a 2edc 030b 000a 6973 5f6e 6577 6c69 6e65 0000 0000 000a daec 0400 3957 0000 38c7 0000 0010 000c 1398 000b 6160
1025340  0001 0047 0000 0000 0008 6973 5f64 6967 6974 0000 2938 0012 000b 6160 4e1c 0000 0000 0003 2edc 03a3 27f0 139e 000b 6160
1025420  2ca0 13a6 0000 0000 0000 0001 000c 1384 000b 6160 0002 438a 000c 13bc 000c 1390 000a 6973 5f65 6e64 6c69 6e65 0000 0000
1025500  000c 0eb0 000c 0e78 2954 000a 0002 438a 228c 13e6 000a 6973 5f65 6e64 6669 6c65 0000 0000 2954 000a 0002 438a 228c 0193
1025560  2c78 0010 0002 438a 239c 0000 000b 88f8 000f 7067 656e 7379 6d5f 636f 756e 7465 7200 1426 2c78 0010 0002 438a 239c 0000
1025640  000b 88c8 0000 38ef b328 0000 000a f414 0000 0000 0010 b2d0 000e 7c20 27f0 039b 000c 1524 2ca0 017b 0000 000c 0000 0003
1025720  000b 6450 000c 1524 0002 438a 000c 1514 000a d3d4 000b 6f62 6a65 6374 5f6e 616d 6500 1486 000c 6572 726f 726d 6573 7361
1026000  6765 0096 0015 4361 6e27 7420 6e61 6d65 206f 626a 6563 7420 6279 2000 28c4 0020 000c 14f4 4e1c 0000 0000 3db7 3050 41d4
1026060  0000 3dc7 239c 0000 000c 14dc ffff ffff 0200 34bf 0000 38c7 0000 0008 000b 64e4 000b 64e4 0001 0047 0000 0000 0002 3a20
1026140  000b 645c 28c4 0020 000c 1524 4e1c 0000 0000 3cc7 3050 41d4 0000 3dcf 239c 0000 000c 14dc 000c 1500 000b 645c 000c 14b8
1026220  0000 0000 2954 0010 0002 438a 3050 22bc 000c 14dc 000b 2a2a 2a20 4552 524f 523a 2000 0007 2c78 0010 0002 438a 239c 0000
1026300  000b 8888 000a 44d8 0000 0000 000b 8a44 000c 15a4 0007 6e65 776c 696e 6500 0343 2c78 0010 0002 438a 239c 0000 000b 8848
1026360  0005 656c 7369 6500 2954 000a 0002 438a 228c 1586 0000 38ef b328 158e 000a f3a8 0000 0000 000a 4588 0000 0000 000a d5a0
1026440  0000 0000 27f0 0028 000b 65ec 2520 46d8 3844 35c8 4300 0000 0000 3d4f 000a d838 0010 39a4 000a df8c 000c 2eb0 001f 5765
1026520  6c63 6f6d 6520 746f 2050 726f 7461 6c6b 2c20 5665 7273 696f 6e20 302e 3100 03ab 000a 7072 6f74 616c 6b2e 706c 0000 0000
1026600  b464 1e24 000b e180 0000 0000 2c78 0012 0002 438a 4e1c 0000 ffff fffb 228c d3c8 b464 0000 000b e154 000a f4a0 000a 2498
```

```
1026660  0300 38f7 0000 3287 0000 000c 000c 165c 000c 165c 0041 0000 0000 0000 2c78 0010 0002 438a 239c 0000 000a 24a8 000b 1a44
1026740  0200 38ff 0000 3287 0000 0008 000c 168c 000c 168c 0041 0000 0000 0000 2c78 0010 0002 438a 239c 0000 000b 1a54 000b 1e7c
1027020  0200 3907 0000 3287 0000 0008 000c 16bc 000c 16bc 0041 0000 0000 0000 2c78 0010 0002 438a 239c 0000 000b 1e8c 000b 1eb4
1027100  0400 390f 0000 3287 0000 0010 000c 16ec 000c 16ec 0041 0000 0000 0000 2c78 0010 0002 438a 239c 0000 000b 1ec4 000c 1168
1027160  0200 1f87 0000 3287 0000 0008 000c 171c 000c 171c 0041 0000 0000 0000 2c78 0010 0002 438a 239c 0000 000a d55c 000a d61c
1027240  0200 3917 0000 3287 0000 0008 000c 174c 000c 174c 0041 0000 0000 0000 2c78 0010 0002 438a 239c 0000 000a d5c0 000c 172c
1027320  0300 3917 0000 3287 0000 000c 000c 177c 000c 177c 0041 0000 0000 0000 2c78 0010 0002 438a 239c 0000 000a d62c 000a d67c
1027400  0200 391f 0000 3287 0000 0008 000c 17ac 000c 17ac 0041 0000 0000 0000 2c78 0010 0002 438a 239c 0000 000a d68c 000a d6f0
1027460  0100 3927 0000 3287 0000 0004 000c 17dc 000c 17dc 0041 0000 0000 0000 2c78 0010 0002 438a 239c 0000 000a d700 000a d764
1027540  0300 392f 0000 3287 0000 000c 000c 180c 000c 180c 0041 0000 0000 0000 2c78 0010 0002 438a 239c 0000 000a d774 000a d7c8
1027620  0200 20f7 0000 3287 0000 0008 000c 183c 000c 183c 0041 0000 0000 0000 2c78 0010 0002 438a 239c 0000 000a d7d8 000a d828
1027700  0300 3937 0000 3287 0000 000c 000c 186c 000c 186c 0041 0000 0000 0000 2c78 0010 0002 438a 239c 0000 000a d838 000a d88c
1027760  0300 393f 0000 3287 0000 000c 000c 189c 000c 189c 0041 0000 0000 0000 2c78 0010 0002 438a 239c 0000 000a d89c 000a d954
1030040  0200 2397 0000 3287 0000 0008 000c 18cc 000c 18cc 0041 0000 0000 0000 2c78 0010 0002 438a 239c 0000 000a d900 000c 18ac
1030120  0300 2397 0000 3287 0000 000c 000c 18fc 000c 18fc 0041 0000 0000 0000 2c78 0010 0002 438a 239c 0000 000a d964 000a d9b4
1030200  0200 3947 0000 3287 0000 0008 000c 192c 000c 192c 0041 0000 0000 0000 2c78 0010 0002 438a 239c 0000 000a d9c4 000a dd0c
1030260  0200 394f 0000 3287 0000 0008 000c 195c 000c 195c 0041 0000 0000 0000 2c78 0010 0002 438a 239c 0000 000a da28 000c 1628
1030340  000b 6465 6c65 7465 5f66 696c 6500 0000 000c 47c8 0000 23a7 b328 198e 000b e0c0 0000 0000 2c78 0010 0002 438a 239c 0000
1030420  000a da9c 000c 1358 0200 3957 0000 3287 0000 0008 000c 19c4 000c 19c4 0041 0000 0000 0000 2c78 0010 0002 438a 239c 0000
1030500  000a dafc 000a db60 0100 395f 0000 3287 0000 0004 000c 19f4 000c 19f4 0041 0000 0000 0000 2c78 0010 0002 438a 239c 0000
1030560  000a db70 000a dbd4 0000 3967 0000 3287 0000 0000 000c 1a24 000c 1a24 0041 0000 0000 0000 2c78 0010 0002 438a 239c 0000
1030640  000a dbe4 000a dc38 0300 396f 0000 3287 0000 000c 000c 1a54 000c 1a54 0041 0000 0000 0000 2c78 0010 0002 438a 239c 0000
1030720  000a dc48 0000 234f b464 036b 000b e120 000c 1610 2c78 0010 0002 438a 239c 0000 000a dcbc 000c 483c 0000 0000 0000 0000
1031000  000c 09ad 0015 426c 6f63 6b20 6465 7669 6365 2072 6571 7569 7265 6400 2c78 0010 0002 438a 239c 0000 000a dd1c 000a dd6c
1031060  0200 3977 0000 3287 0000 0008 000c 1adc 000c 1adc 0041 0000 0000 0000 2c78 0020 0002 438a 3640 43e4 0200 0daf 4b8c 0000
1031140  0000 3287 6bc8 22bc 000a dd7c 000a dde0 0200 397f 0000 3287 0000 0008 000c 1b1c 000c 1b1c 0041 0000 0000 0000 2c78 0010
1031220  0002 438a 239c 0000 000a ddf0 000a deb8 0200 3987 0000 3287 0000 0008 000c 1b4c 000c 1b4c 0041 0000 0000 0000 2c78 0010
1031300  0002 438a 239c 0000 000a de54 000c 1b2c 0300 3987 0000 3287 0000 000c 000c 1b7c 000c 1b7c 0041 0000 0000 0000 2c78 0010
1031360  0002 438a 239c 0000 000a dec8 000a df18 0300 398f 0000 3287 0000 000c 000c 1bac 000c 1bac 0041 0000 0000 0000 2c78 0020
1031440  0002 438a 36b8 4408 0200 0daf 4b8c 0000 0000 3287 6c08 22bc 000a df28 0000 2a77 b328 0007 000b e1b4 0000 0000 000c 1984
1031520  000c 1a64 000c 1bcc 000c 1d4c 2c78 0010 0002 438a 239c 0000 000a df8c 000a dfdc 0000 38c7 0000 3287 0000 0000 000c 1c1c
1031600  000c 1c1c 0041 0000 0000 0000 2c78 0010 0002 438a 239c 0000 000a dfec 000a e048 0300 3997 0000 3287 0000 000c 000c 1c4c
1031660  000c 1c4c 0041 0000 0000 0000 2c78 0010 0002 438a 239c 0000 000a e058 000a e110 0100 399f 0000 3287 0000 0004 000c 1c7c
1031740  000c 1c7c 0041 0000 0000 0000 2c78 0010 0002 438a 239c 0000 000a e0bc 000c 1c5c 0200 399f 0000 3287 0000 0008 000c 1cac
1032020  000c 1cac 0041 0000 0000 0000 2c78 0010 0002 438a 239c 0000 000a e120 000a e170 0100 39a7 0000 3287 0000 0004 000c 1cdc
1032100  000c 1cdc 0041 0000 0000 0000 2c78 0010 0002 438a 239c 0000 000a e180 000a e1d4 0100 39af 0000 3287 0000 0004 000c 1d0c
1032160  000c 1d0c 0041 0000 0000 0000 2c78 0010 0002 438a 239c 0000 000a e1e4 000a e238 0100 39b7 0000 3287 0000 0004 000c 1d3c
1032240  000c 1d3c 0041 0000 0000 0000 2c78 0010 0002 438a 239c 0000 000a e248 0000 2e1f b464 1d49 000b e1e8 000b 1e20 2c78 0010
1032320  0002 438a 239c 0000 000a e2ac 2c78 0010 0002 438a 239c 0000 000a e30c 000a e35c 0300 39bf 0000 3287 0000 000c 000c 1d9c
1032400  000c 1d9c 0041 0000 0000 0000 2c78 0010 0002 438a 239c 0000 000a e36c 000a e3d0 0300 2f9f 0000 3287 0000 000c 000c 1dcc
1032460  000c 1dcc 0041 0000 0000 0000 2c78 0010 0002 438a 239c 0000 000a e3e0 000c 1ee8 0000 0084 000c 1de8 000c 1df8 0000 000c
1032540  000c 1df4 000c 1e04 0000 000c 000c 1e00 000c 1e10 0000 000c 000c 1e0c 000c 1e1c 0000 000c 000c 1e18 000c 1e28 0000 000c
1032620  000c 1e24 000c 1e34 0000 000c 000c 1e30 000c 1e40 0000 000c 000c 1e3c 000c 1e4c 0000 000c 000c 1e48 000c 1e58 0000 000c
1032700  000c 1e54 000c 1ea0 0000 000c 000c 1e60 0009 6374 7970 6573 2e70 6c00 0008 6765 745f 6c69 6e65 0060 0009 6667 6574 5f6c
1032760  696e 6500 0009 7075 745f 6369 6172 7300 0008 7075 745f 6c69 6e65 0084 0006 7265 6e61 6d65 000c 1ee4 b464 1eb8 000c 2238
1033040  0000 0000 b464 1ec4 000c 226c 0000 0000 0014 6f70 6572 6174 696f 6e20 7375 6363 6573 7366 756c 0000 b464 1ea0 000c 2178
1033120  000d 10b0 000c 1f30 0000 003c 000c 1ef0 000c 1f00 0000 000c 000c 1efc 000c 1f0c 0000 000c 000c 1188 000c 1f18 0000 000c
1033200  000c 1f14 000c 1f30 0000 000c 000c 0bc8 0009 6c69 6e65 696f 2e70 6c00 000c 2334 0000 006c 000c 0b84 000c 1f48 0000 000c
1033260  000c 1f2c 000c 1f54 0000 000c 000c 1f38 000c 1f60 0000 000c 000c 1f44 000c 1f6c 0000 000c 000c 1f50 000c 1f78 0000 000c
1033340  000c 1f5c 000c 1f84 0000 000c 000c 1f68 000c 1f90 0000 000c 000c 1f74 000c 1fc0 0000 000c 000c 1f90 b464 1ff0 000b 08ac
1033420  000c 1ed8 27f0 000c 000c 4b24 4950 228c 0006 7261 6e67 6531 000c 1fbc 0014 6375 7272 656e 745f 6465 6331 305f 7374 7265
1033500  616d 00bc b464 1fcc 000a fa2c 0000 0000 b464 1fd8 000a f9f8 000c 1fd4 0009 6f70 656e 5f66 696c 6500 0008 746f 5f75 7070
1033560  6572 0004 0008 746f 5f6c 6f77 6572 0010 0008 6973 5f77 6869 7465 001c 0008 6973 5f73 7061 6365 0028 0008 6973 5f71 756f
1033640  7465 0034 0008 6973 5f70 756e 6374 0040 0008 6973 5f70 7269 6e74 004c 0009 6973 5f70 6572 696f 6400 0008 6973 5f70 6172
1033720  656e 0064 0008 6973 5f6c 6f77 6572 0070 0009 6973 5f6c 6179 6f75 7400 0008 6973 5f67 7261 7068 0088 0008 6973 5f63 7379
```

```
1034000 6d66 0094 0007 6973 5f63 7379 6d00 20a0 0008 6973 5f63 6e74 726c 00ac 0007 6973 5f63 6861 7200 20b8 0008 6973 5f61 7363
1034060 6969 00c4 0008 6973 5f61 6c70 6361 00d0 0008 6973 5f61 6c6e 756d 0000 0006 6374 7970 6573 0000 0000 0006 6c69 6e65 696f
1034140 0000 0000 0009 6d61 7962 655f 6e65 7700 0000 002c 000a a534 b27c b66c 0000 0268 7fff ffff 000a f790 0200 0db5 0200 2f35
1034220 0000 3e5f 0000 027b 0000 315f 0000 002c 000b 0200 b27c b66c 0000 0280 7fff ffff 000a f7bc 0200 0db5 0200 224d 0000 3e5f
1034300 0000 3e17 0000 315f 0011 636c 6f73 655f 616c 6c5f 7374 7265 616d 7300 0000 002c 000b 08a8 b27c b66c 0000 0281 7fff ffff
1034360 000c 8e64 0200 0db5 0200 24bd 0000 3287 0000 3e17 0000 315f 0000 002c 000a f828 b27c b66c 0000 026c 7fff ffff 000a e620
1034440 0200 0db5 0200 284d 0000 3e17 0000 3e5f 0000 315f 0000 0034 000a fd9c b27c b66c 0000 026d 7fff ffff 000c 2200 0200 0db5
1034520 0400 242d 0000 3f77 0000 000b 0000 3e17 0000 21cf 0000 315f 0000 0034 000c 21cc b27c b66c 0000 026e 7fff ffff 000c 2234
1034600 0200 0db5 0400 242d 0000 3f7f 0000 0013 0000 3e17 0000 21cf 0000 315f 0000 0034 000c 2200 b27c b66c 0000 026f 7fff ffff
1034660 000c 2268 0200 0db5 0400 242d 0000 3f77 0000 0013 0000 3e17 0000 21cf 0000 315f 0000 0034 000c 2234 b27c b66c 0000 0270
1034740 7fff ffff 000c 229c 0200 0db5 0400 242d 0000 3f7f 0000 001b 0000 3e17 0000 21cf 0000 315f 0000 0034 000c 2268 b27c b66c
1035020 0000 0271 7fff ffff 000c 22d0 0200 0db5 0400 242d 0000 3f87 0000 000b 0000 3e17 0000 21cf 0000 315f 0000 0034 000c 229c
1035100 b27c b66c 0000 0272 7fff ffff 000c 2304 0200 0db5 0400 242d 0000 3f8f 0000 000b 0000 3e17 0000 21cf 0000 315f 0000 0034
1035160 000c 22d0 b27c b66c 0000 0273 7fff ffff 000a d43c 0200 0db5 0400 242d 0000 3f97 0000 0003 0000 3e17 0000 21cf 0000 315f
1035240 000c 2418 0000 00d4 b27c b66c 0000 0274 0000 0282 000a a534 0200 0db5 0500 1cdd 0000 2def 0000 000b 0000 3e17 0064 4c03
1035320 0000 027b 0000 315f 000c 2418 0000 002c b4f0 b4e4 0000 0273 7fff ffff 0008 b0dd 0000 0000 0000 0000 000c 263c 0002 438a
1035400 000c 8c24 000c 23d0 0000 0038 b27c b66c 0000 0e1c 0000 0e7c 000c 23d4 0200 0db5 0500 1cdd 0000 6f87 0000 0013 0000 6e3f
1035460 00a3 ed43 0000 03ab 0000 315f 000c 2418 0000 0038 b27c b66c 0000 0e1d 0000 0e7d 0013 fb34 0200 0db5 0500 1cdd 0000 2fdf
1035540 0000 000b 0000 6e3f 00a2 cfa3 0000 03ab 0000 315f 000b 6461 7465 5f70 6c75 735f 3200 0000 000c 24dc 0000 0070 b27c b66c
1035620 0000 0277 0000 0284 000c 2454 0200 0db5 0500 1cdd 0000 3f77 0000 0013 0000 3e17 0064 45e3 0000 027b 0000 315f 000c 24dc
1035700 0000 0038 b27c b66c 0000 0278 0000 0285 000c 24e0 0200 0db5 0500 1cdd 0000 3f9f 0000 0013 0000 3e17 0064 50c3 0000 027b
1035760 0000 315f 2c78 0054 0002 438a 45d0 46d8 329c 247c 0008 c23c 0018 aa34 aab4 0020 a38c 0026 aa34 aab4 0009 a2bc 001c aa34
1036040 aab4 0005 a2bc 0012 379c 4c70 0000 0007 3788 4a7c 000c 723c 379c 56f8 6d50 671c 37dc 234c 000c 8a18 000c 2540 0000 0038
1036120 b27c b66c 0000 0279 0000 0286 000c 2544 0200 0db5 0500 1cdd 0000 3f7f 0000 0013 0000 3e17 0064 44e3 0000 027b 0000 315f
1036200 2c78 002a 0002 438a 2520 46d8 33d8 332c 2410 0000 000c 88dc 0018 aa50 aab4 0000 a3ec 3d00 4a7c 000c 723c 6172 000c 25c8
1036260 0000 0038 b27c b66c 0000 027a 0000 0287 000c 25cc 0200 0db5 0500 1cdd 0000 3f7f 0000 001b 0000 3e17 0064 46e3 0000 027b
1036340 0000 315f 2c78 0050 0002 438a 45e8 0020 4700 4740 32f0 001c 24d0 0000 0008 bafc 0024 3c9c 0000 0020 0008 dcdc 0020 332c
1036420 32d4 247c 000c 8a18 0f20 411c 0000 001c 0008 e17c 001c 3d18 4a7c 0014 3d00 4a7c 000c 723c 000c 26a8 0000 00a8 b27c b66c
1036500 0000 027b 0000 0288 000c 2604 0200 0db5 0500 1cd1 0000 3f8f 0000 000b 0000 3e17 0064 48e3 0000 027b 0000 315f 000c 2638
1036560 0000 0038 b27c b66c 0000 027c 0000 0289 000c 263c 0200 0db5 0500 1cdd 0000 3f87 0000 000b 0000 3e17 0064 47e3 0000 027b
1036640 0000 315f 000c 26a8 0000 0038 b130 b66c 0000 027d 0000 028a 000c 2371 0200 0db5 0500 1cdd 0000 3f97 0000 0003 0000 3e17
1036720 0064 49e3 0000 027b 0000 315f 2c78 0038 0002 438a 2520 247c 0008 dadc 0010 3280 24d0 0000 0008 c23c 0010 aa18 aab4 0020
1037000 a354 aa18 aab4 0009 a260 aa18 aab4 0005 a260 2eb0 000c 7290 0000 1a64 2063 6861 7261 6374 6572 2063 6f64 6573 2e0a 0a72
1037060 616e 6765 2858 2c20 4c2c 2055 2920 3a2d 0a09 2820 2020 696e 7465 6765 7228 5829 202d 3e20 4c20 3d3c 2058 2c20 5820 3d3c
1037140 2055 0a09 3b20 2020 7661 7228 5829 202d 3e20 2020 2020 7261 6e67 6531 284c 2c20 552c 2058 290a 0929 2e0a 0a72 616e 6765
1037220 3128 582c 205f 2c20 5829 2e0a 7261 6e67 6531 284c 2c20 552c 2058 2920 3a2d 0a09 4d20 6973 204c 2b31 2c0a 094d 203d 3c20
1037300 552c 0a09 7261 6e67 6531 284d 2c20 552c 2058 292e 0a0a 0a2f 2a20 2054 6865 2041 5343 4949 2070 6172 7420 6f66 2074 6865
1037360 2074 6162 6c65 2062 656c 6f77 2077 6173 2062 6f6f 7473 7472 6170 7065 6420 6672 6f6d 2061 6e20 6561 726c 6965 720a 2020
1037440 2020 7665 7273 696f 6e20 6f66 206c 6962 7261 7279 2863 7479 7065 7329 2075 7369 6e67 2074 6865 2066 6f6c 6c6f 7769 6e67
1037520 2063 6f64 653a 0a0a 0974 656c 6c28 6269 7473 292c 0a09 6973 5f61 7363 6969 2843 292c 0a09 2820 2020 6973 5f64 6967 6974
1037600 2843 2920 2d3e 204d 2069 7320 4320 2d20 3027 3020 2b20 2020 2020 2038 2730 3430 300a 093b 2020 2069 735f 7570 7065 7228
1037660 4329 202d 3e20 4420 6973 2043 202d 2030 2741 202b 2031 3020 2b20 3827 3130 3030 0a09 3b20 2020 6973 5f6c 6f77 6572 2843
1037740 2920 2d3e 204d 2069 7320 4320 2d20 3027 6120 2b20 3130 202b 2038 2732 3030 300a 093b 2020 2069 735f 6373 796d 6628 4329
1040020 202d 3e20 4d20 6973 2038 2734 3037 370a 093b 2020 2043 203d 3a3d 2022 2022 2020 202d 3e20 4d20 6973 2038 2730 3237 370a
1040100 093b 2020 2069 735f 7370 6163 6528 4329 202d 3e20 4d20 6973 2038 2730 3337 370a 093b 2020 2069 735f 636e 7472 6c28 4329
1040160 202d 3e20 4d20 6973 2038 2730 3137 370a 093b 0909 2020 204d 2069 7320 3827 3030 3737 0a09 292c 0a09 666f 726d 6174 2827
1040240 6269 7473 287e 7c7e 747e 647e 332b 2c20 3227 277e 7c7e 6030 747e 3272 7e31 322b 292e 7e6e 272c 205b 432c 4d5d 292c 0a09
1040320 6661 696c 0a20 2020 203b 0974 6f6c 642e 0a2a 2f0a 0a62 6974 7328 2020 302c 2032 2730 3030 3030 3131 3131 3131 3129 2e0a
1040400 6269 7473 2820 2031 2c20 3227 3030 3030 3031 3131 3131 3131 292e 0a62 6974 7328 2020 322c 2032 2730 3030 3030 3131 3131
1040460 3131 3129 2e0a 6269 7473 2820 2033 2c20 3227 3030 3030 3031 3131 3131 3131 292e 0a62 6974 7328 2020 342c 2032 2730 3030
1040540 3030 3131 3131 3131 3129 2e0a 6269 7473 2820 2035 2c20 3227 3030 3030 3031 3131 3131 3131 292e 0a62 6974 7328 2020 362c
1040620 2032 2730 3030 3030 3131 3131 3131 3129 2e0a 6269 7473 2820 2037 2c20 3227 3030 3030 3031 3131 3131 3131 292e 0a62 6974
1040700 7328 2020 382c 2032 2730 3030 3030 3131 3131 3131 3129 2e0a 6269 7473 2820 2039 2c20 3227 3030 3030 3131 3131 3131 3131
1040760 292e 0a62 6974 7328 2031 302c 2032 2730 3030 3031 3131 3131 3131 3129 2e0a 6269 7473 2820 3131 2c20 3227 3030 3030 3131
1041040 3131 3131 3131 292e 0a62 6974 7328 2031 322c 2032 2730 3030 3031 3131 3131 3131 3129 2e0a 6269 7473 2820 3133 2c20 3227
```

| | | | | | | | | | | | | | | | | | | | | | | | | |
|---|---|---|---|---|---|---|---|---|---|---|---|---|---|---|---|---|---|---|---|---|---|---|---|---|
| 1041120 | 3030 | 3030 | 3131 | 3131 | 3131 | 3131 | 292e | 0a62 | 6974 | 7328 | 2031 | 342c | 2032 | 2730 | 3030 | 3030 | 3131 | 3131 | 3131 | 3129 | 2e0a | 6269 | 7473 | 2820 |
| 1041200 | 3135 | 2c20 | 3227 | 3030 | 3030 | 3031 | 3131 | 3131 | 3131 | 292e | 0a62 | 6974 | 7328 | 2031 | 362c | 2032 | 2730 | 3030 | 3030 | 3131 | 3131 | 3131 | 3129 | 2e0a |
| 1041260 | 6269 | 7473 | 2820 | 3137 | 2c20 | 3227 | 3030 | 3030 | 3031 | 3131 | 3131 | 3131 | 292e | 0a62 | 6974 | 7328 | 2031 | 382c | 2032 | 2730 | 3030 | 3030 | 3131 | 3131 |
| 1041340 | 3131 | 3129 | 2e0a | 6269 | 7473 | 2820 | 3139 | 2c20 | 3227 | 3030 | 3030 | 3031 | 3131 | 3131 | 3131 | 292e | 0a62 | 6974 | 7328 | 2032 | 302c | 2032 | 2730 | 3030 |
| 1041420 | 3030 | 3131 | 3131 | 3131 | 3129 | 2e0a | 6269 | 7473 | 2820 | 3231 | 2c20 | 3227 | 3030 | 3030 | 3031 | 3131 | 3131 | 3131 | 292e | 0a62 | 6974 | 7328 | 2032 | 322c |
| 1041500 | 2032 | 2730 | 3030 | 3030 | 3131 | 3131 | 3131 | 3129 | 2e0a | 6269 | 7473 | 2820 | 3233 | 2c20 | 3227 | 3030 | 3030 | 3031 | 3131 | 3131 | 3131 | 292e | 0a62 | 6974 |
| 1041560 | 7328 | 2032 | 342c | 2032 | 2730 | 3030 | 3030 | 3131 | 3131 | 3131 | 3129 | 2e0a | 6269 | 7473 | 2820 | 3235 | 2c20 | 3227 | 3030 | 3030 | 3031 | 3131 | 3131 | 3131 |
| 1041640 | 292e | 0a62 | 6974 | 7328 | 2032 | 362c | 2032 | 2730 | 3030 | 3030 | 3131 | 3131 | 3131 | 3129 | 2e0a | 6269 | 7473 | 2820 | 3237 | 2c20 | 3227 | 3030 | 3030 | 3031 |
| 1041720 | 3131 | 3131 | 3131 | 292e | 0a62 | 6974 | 7328 | 2032 | 382c | 2032 | 2730 | 3030 | 3030 | 3131 | 3131 | 3131 | 3129 | 2e0a | 6269 | 7473 | 2820 | 3239 | 2c20 | 3227 |
| 1042000 | 3030 | 3030 | 3031 | 3131 | 3131 | 3131 | 292e | 0a62 | 6974 | 7328 | 2033 | 302c | 2032 | 2730 | 3030 | 3030 | 3131 | 3131 | 3131 | 3129 | 2e0a | 6269 | 7473 | 2820 |
| 1042060 | 3331 | 2c20 | 3227 | 3030 | 3030 | 3131 | 3131 | 3131 | 3131 | 292e | 0a62 | 6974 | 7328 | 2033 | 322c | 2032 | 2730 | 3030 | 3031 | 3031 | 3131 | 3131 | 3129 | 2e0a |
| 1042140 | 6269 | 7473 | 2820 | 3333 | 2c20 | 3227 | 3030 | 3030 | 3030 | 3131 | 3131 | 3131 | 292e | 0a62 | 6974 | 7328 | 2033 | 342c | 2032 | 2730 | 3030 | 3030 | 3031 | 3131 |
| 1042220 | 3131 | 3129 | 2e0a | 6269 | 7473 | 2820 | 3335 | 2c20 | 3227 | 3030 | 3030 | 3030 | 3131 | 3131 | 3131 | 292e | 0a62 | 6974 | 7328 | 2033 | 362c | 2032 | 2730 | 3030 |
| 1042300 | 3030 | 3031 | 3131 | 3131 | 3129 | 2e0a | 6269 | 7473 | 2820 | 3337 | 2c20 | 3227 | 3030 | 3030 | 3030 | 3131 | 3131 | 3131 | 292e | 0a62 | 6974 | 7328 | 2033 | 382c |
| 1042360 | 2032 | 2730 | 3030 | 3030 | 3031 | 3131 | 3131 | 3129 | 2e0a | 6269 | 7473 | 2820 | 3339 | 2c20 | 3227 | 3030 | 3030 | 3030 | 3131 | 3131 | 3131 | 292e | 0a62 | 6974 |
| 1042440 | 7328 | 2034 | 302c | 2032 | 2730 | 3030 | 3030 | 3031 | 3131 | 3131 | 3129 | 2e0a | 6269 | 7473 | 2820 | 3431 | 2c20 | 3227 | 3030 | 3030 | 3030 | 3131 | 3131 | 3131 |
| 1042520 | 292e | 0a62 | 6974 | 7328 | 2034 | 322c | 2032 | 2730 | 3030 | 3030 | 3031 | 3131 | 3131 | 3129 | 2e0a | 6269 | 7473 | 2820 | 3433 | 2c20 | 3227 | 3030 | 3030 | 3030 |
| 1042600 | 3131 | 3131 | 3131 | 292e | 0a62 | 6974 | 7328 | 2034 | 342c | 2032 | 2730 | 3030 | 3030 | 3031 | 3131 | 3131 | 3129 | 2e0a | 6269 | 7473 | 2820 | 3435 | 2c20 | 3227 |
| 1042660 | 3030 | 3030 | 3030 | 3131 | 3131 | 3131 | 292e | 0a62 | 6974 | 7328 | 2034 | 362c | 2032 | 2730 | 3030 | 3030 | 3031 | 3131 | 3131 | 3129 | 2e0a | 6269 | 7473 | 2820 |
| 1042740 | 3437 | 2c20 | 3227 | 3030 | 3030 | 3030 | 3131 | 3131 | 3131 | 292e | 0a62 | 6974 | 7328 | 2034 | 382c | 2032 | 2730 | 3030 | 3130 | 3030 | 3030 | 3030 | 3029 | 2e0a |
| 1043020 | 6269 | 7473 | 2820 | 3439 | 2c20 | 3227 | 3030 | 3031 | 3030 | 3030 | 3030 | 3031 | 292e | 0a62 | 6974 | 7328 | 2035 | 302c | 2032 | 2730 | 3030 | 3130 | 3030 | 3030 |
| 1043100 | 3031 | 3029 | 2e0a | 6269 | 7473 | 2820 | 3531 | 2c20 | 3227 | 3030 | 3031 | 3030 | 3030 | 3030 | 3131 | 292e | 0a62 | 6974 | 7328 | 2035 | 322c | 2032 | 2730 | 3030 |
| 1043160 | 3130 | 3030 | 3030 | 3130 | 3029 | 2e0a | 6269 | 7473 | 2820 | 3533 | 2c20 | 3227 | 3030 | 3031 | 3030 | 3030 | 3031 | 3031 | 292e | 0a62 | 6974 | 7328 | 2035 | 342c |
| 1043240 | 2032 | 2730 | 3030 | 3130 | 3030 | 3030 | 3131 | 3029 | 2e0a | 6269 | 7473 | 2820 | 3535 | 2c20 | 3227 | 3030 | 3031 | 3030 | 3030 | 3031 | 3131 | 292e | 0a62 | 6974 |
| 1043320 | 7328 | 2035 | 362c | 2032 | 2730 | 3030 | 3130 | 3030 | 3031 | 3030 | 3029 | 2e0a | 6269 | 7473 | 2820 | 3537 | 2c20 | 3227 | 3030 | 3031 | 3030 | 3030 | 3130 | 3031 |
| 1043400 | 292e | 0a62 | 6974 | 7328 | 2035 | 382c | 2032 | 2730 | 3030 | 3030 | 3031 | 3131 | 3131 | 3129 | 2e0a | 6269 | 7473 | 2820 | 3539 | 2c20 | 3227 | 3030 | 3030 | 3030 |
| 1043460 | 3131 | 3131 | 3131 | 292e | 0a62 | 6974 | 7328 | 2036 | 302c | 2032 | 2730 | 3030 | 3030 | 3031 | 3131 | 3131 | 3129 | 2e0a | 6269 | 7473 | 2820 | 3631 | 2c20 | 3227 |
| 1043540 | 3030 | 3030 | 3030 | 3131 | 3131 | 3131 | 292e | 0a62 | 6974 | 7328 | 2036 | 322c | 2032 | 2730 | 3030 | 3030 | 3031 | 3131 | 3131 | 3129 | 2e0a | 6269 | 7473 | 2820 |
| 1043620 | 3633 | 2c20 | 3227 | 3030 | 3030 | 3030 | 3131 | 3131 | 3131 | 292e | 0a62 | 6974 | 7328 | 2036 | 342c | 2032 | 2730 | 3030 | 3030 | 3031 | 3131 | 3131 | 3129 | 2e0a |
| 1043700 | 6269 | 7473 | 2820 | 3635 | 2c20 | 3227 | 3030 | 3130 | 3030 | 3030 | 3130 | 3130 | 292e | 0a62 | 6974 | 7328 | 2036 | 362c | 2032 | 2730 | 3031 | 3030 | 3030 | 3031 |
| 1043760 | 3031 | 3129 | 2e0a | 6269 | 7473 | 2820 | 3637 | 2c20 | 3227 | 3030 | 3130 | 3030 | 3030 | 3131 | 3030 | 292e | 0a62 | 6974 | 7328 | 2036 | 382c | 2032 | 2730 | 3031 |
| 1044040 | 3030 | 3030 | 3031 | 3130 | 3129 | 2e0a | 6269 | 7473 | 2820 | 3639 | 2c20 | 3227 | 3030 | 3130 | 3030 | 3030 | 3131 | 3130 | 292e | 0a62 | 6974 | 7328 | 2037 | 302c |
| 1044120 | 2032 | 2730 | 3031 | 3030 | 3030 | 3031 | 3131 | 3129 | 2e0a | 6269 | 7473 | 2820 | 3731 | 2c20 | 3227 | 3030 | 3130 | 3030 | 3031 | 3030 | 3030 | 292e | 0a62 | 6974 |
| 1044200 | 7328 | 2037 | 322c | 2032 | 2730 | 3031 | 3030 | 3030 | 3130 | 3030 | 3129 | 2e0a | 6269 | 7473 | 2820 | 3733 | 2c20 | 3227 | 3030 | 3130 | 3030 | 3031 | 3030 | 3130 |
| 1044260 | 292e | 0a62 | 6974 | 7328 | 2037 | 342c | 2032 | 2730 | 3031 | 3030 | 3030 | 3130 | 3031 | 3129 | 2e0a | 6269 | 7473 | 2820 | 3735 | 2c20 | 3227 | 3030 | 3130 | 3030 |
| 1044340 | 3031 | 3031 | 3030 | 292e | 0a62 | 6974 | 7328 | 2037 | 362c | 2032 | 2730 | 3031 | 3030 | 3030 | 3130 | 3130 | 3129 | 2e0a | 6269 | 7473 | 2820 | 3737 | 2c20 | 3227 |
| 1044420 | 3030 | 3130 | 3030 | 3031 | 3031 | 3130 | 292e | 0a62 | 6974 | 7328 | 2037 | 382c | 2032 | 2730 | 3031 | 3030 | 3030 | 3130 | 3131 | 3129 | 2e0a | 6269 | 7473 | 2820 |
| 1044500 | 3739 | 2c20 | 3227 | 3030 | 3130 | 3030 | 3031 | 3130 | 3030 | 292e | 0a62 | 6974 | 7328 | 2038 | 302c | 2032 | 2730 | 3031 | 3030 | 3030 | 3131 | 3030 | 3129 | 2e0a |
| 1044560 | 6269 | 7473 | 2820 | 3831 | 2c20 | 3227 | 3030 | 3130 | 3030 | 3031 | 3130 | 3130 | 292e | 0a62 | 6974 | 7328 | 2038 | 322c | 2032 | 2730 | 3031 | 3030 | 3030 | 3131 |
| 1044640 | 3031 | 3129 | 2e0a | 6269 | 7473 | 2820 | 3833 | 2c20 | 3227 | 3030 | 3130 | 3030 | 3031 | 3131 | 3030 | 292e | 0a62 | 6974 | 7328 | 2038 | 342c | 2032 | 2730 | 3031 |
| 1044720 | 3030 | 3030 | 3131 | 3130 | 3129 | 2e0a | 6269 | 7473 | 2820 | 3835 | 2c20 | 3227 | 3030 | 3130 | 3030 | 3031 | 3131 | 3130 | 292e | 0a62 | 6974 | 7328 | 2038 | 362c |
| 1045000 | 2032 | 2730 | 3031 | 3030 | 3030 | 3131 | 3131 | 3129 | 2e0a | 6269 | 7473 | 2820 | 3837 | 2c20 | 3227 | 3030 | 3130 | 3030 | 3130 | 3030 | 3030 | 292e | 0a62 | 6974 |
| 1045060 | 7328 | 2038 | 382c | 2032 | 2730 | 3031 | 3030 | 3031 | 3030 | 3030 | 3129 | 2e0a | 6269 | 7473 | 2820 | 3839 | 2c20 | 3227 | 3030 | 3130 | 3030 | 3130 | 3030 | 3130 |
| 1045140 | 292e | 0a62 | 6974 | 7328 | 2039 | 302c | 2032 | 2730 | 3031 | 3030 | 3031 | 3030 | 3031 | 3129 | 2e0a | 6269 | 7473 | 2820 | 3931 | 2c20 | 3227 | 3030 | 3030 | 3030 |
| 1045220 | 3131 | 3131 | 3131 | 292e | 0a62 | 6974 | 7328 | 2039 | 322c | 2032 | 2730 | 3030 | 3030 | 3031 | 3131 | 3131 | 3129 | 2e0a | 6269 | 7473 | 2820 | 3933 | 2c20 | 3227 |
| 1045300 | 3030 | 3030 | 3030 | 3131 | 3131 | 3131 | 292e | 0a62 | 6974 | 7328 | 2039 | 342c | 2032 | 2730 | 3030 | 3030 | 3031 | 3131 | 3131 | 3129 | 2e0a | 6269 | 7473 | 2820 |
| 1045360 | 3935 | 2c32 | 2731 | 3030 | 3030 | 3030 | 3131 | 3131 | 3131 | 292e | 0a62 | 6974 | 7328 | 2039 | 362c | 2032 | 2730 | 3030 | 3030 | 3031 | 3131 | 3131 | 3129 | 2e0a |
| 1045440 | 6269 | 7473 | 2820 | 3937 | 2c20 | 3227 | 3031 | 3030 | 3030 | 3030 | 3130 | 3130 | 292e | 0a62 | 6974 | 7328 | 2039 | 382c | 2032 | 2730 | 3130 | 3030 | 3030 | 3031 |
| 1045520 | 3031 | 3129 | 2e0a | 6269 | 7473 | 2820 | 3939 | 2c20 | 3227 | 3031 | 3030 | 3030 | 3030 | 3131 | 3030 | 292e | 0a62 | 6974 | 7328 | 3130 | 302c | 2032 | 2730 | 3130 |
| 1045600 | 3030 | 3030 | 3031 | 3130 | 3129 | 2e0a | 6269 | 7473 | 2831 | 3031 | 2c20 | 3227 | 3031 | 3030 | 3030 | 3030 | 3131 | 3130 | 292e | 0a62 | 6974 | 7328 | 3130 | 322c |
| 1045660 | 2032 | 2730 | 3130 | 3030 | 3030 | 3031 | 3131 | 3129 | 2e0a | 6269 | 7473 | 2831 | 3033 | 2c20 | 3227 | 3031 | 3030 | 3030 | 3031 | 3030 | 3030 | 292e | 0a62 | 6974 |
| 1045740 | 7328 | 3130 | 342c | 2032 | 2730 | 3130 | 3030 | 3030 | 3130 | 3030 | 3129 | 2e0a | 6269 | 7473 | 2831 | 3035 | 2c20 | 3227 | 3031 | 3030 | 3030 | 3031 | 3030 | 3130 |
| 1046020 | 292e | 0a62 | 6974 | 7328 | 3130 | 362c | 2032 | 2730 | 3130 | 3030 | 3030 | 3130 | 3031 | 3129 | 2e0a | 6269 | 7473 | 2831 | 3037 | 2c20 | 3227 | 3031 | 3030 | 3030 |
| 1046100 | 3031 | 3031 | 3030 | 292e | 0a62 | 6974 | 7328 | 3130 | 382c | 2032 | 2730 | 3130 | 3030 | 3030 | 3130 | 3130 | 3129 | 2e0a | 6269 | 7473 | 2831 | 3039 | 2c20 | 3227 |
| 1046160 | 3031 | 3030 | 3030 | 3031 | 3031 | 3130 | 292e | 0a62 | 6974 | 7328 | 3131 | 302c | 2032 | 2730 | 3130 | 3030 | 3030 | 3130 | 3131 | 3129 | 2e0a | 6269 | 7473 | 2831 |

```
1046240  3131 2c20 3227 3031 3030 3030 3031 3130 3030 292e 0a62 6974 7328 3131 322c 2032 2730 3130 3030 3030 3131 3030 3129 2e0a
1046320  6269 7473 2831 3133 2c20 3227 3031 3030 3030 3031 3130 3130 292e 0a62 6974 7328 3131 342c 2032 2730 3130 3030 3030 3131
1046400  3031 3129 2e0a 6269 7473 2831 3135 2c20 3227 3031 3030 3030 3031 3131 3030 292e 0a62 6974 7328 3131 362c 2032 2730 3130
1046460  3030 3030 3131 3130 3129 2e0a 6269 7473 2831 3137 2c20 3227 3031 3030 3030 3031 3131 3130 292e 0a62 6974 7328 3131 382c
1046540  2032 2730 3130 3030 3030 3131 3131 3129 2e0a 6269 7473 2831 3139 2c20 3227 3031 3030 3030 3130 3030 3030 292e 0a62 6974
1046620  7328 3132 302c 2032 2730 3130 3030 3031 3030 3030 3129 2e0a 6269 7473 2831 3231 2c20 3227 3031 3030 3030 3130 3030 3130
1046700  292e 0a62 6974 7328 3132 322c 2032 2730 3130 3030 3031 3030 3031 3129 2e0a 6269 7473 2831 3233 2c20 3227 3030 3030 3030
1046760  3131 3131 3131 292e 0a62 6974 7328 3132 342c 2032 2730 3030 3030 3031 3131 3131 3129 2e0a 6269 7473 2831 3235 2c20 3227
1047040  3030 3030 3030 3131 3131 3131 292e 0a62 6974 7328 3132 362c 2032 2730 3030 3030 3031 3131 3131 3129 2e0a 6269 7473 2831
1047120  3237 2c20 3227 3030 3030 3031 3131 3131 3131 292e 0a62 6974 7328 3132 382c 2032 2730 3030 3030 3131 3131 3131 3129 2e0a
1047200  6269 7473 2831 3239 2c20 3227 3030 3030 3031 3131 3131 3131 292e 0a62 6974 7328 3133 302c 2032 2730 3030 3030 3131 3131
1047260  3131 3129 2e0a 6269 7473 2831 3331 2c20 3227 3030 3030 3031 3131 3131 3131 292e 0a62 6974 7328 3133 322c 2032 2730 3030
1047340  3030 3131 3131 3131 3129 2e0a 6269 7473 2831 3333 2c20 3227 3030 3030 3031 3131 3131 3131 292e 0a62 6974 7328 3133 342c
1047420  2032 2730 3030 3030 3131 3131 3131 3129 2e0a 6269 7473 2831 3335 2c20 3227 3030 3030 3031 3131 3131 3131 292e 0a62 6974
1047500  7328 3133 362c 2032 2730 3030 3030 3131 3131 3131 3129 2e0a 6269 7473 2831 3337 2c20 3227 3030 3030 3031 3131 3131 3131
1047560  292e 0a62 6974 7328 3133 382c 2032 2730 3030 3030 3131 3131 3131 3129 2e0a 6269 7473 2831 3339 2c20 3227 3030 3030 3031
1047640  3131 3131 3131 292e 0a62 6974 7328 3134 302c 2032 2730 3030 3030 3131 3131 3131 3129 2e0a 6269 7473 2831 3431 2c20 3227
1047720  3030 3030 3031 3131 3131 3131 292e 0a62 6974 7328 3134 322c 2032 2730 3030 3030 3131 3131 3131 3129 2e0a 6269 7473 2831
1050000  3433 2c20 3227 3030 3030 3031 3131 3131 3131 292e 0a62 6974 7328 3134 342c 2032 2730 3030 3030 3131 3131 3131 3129 2e0a
1050060  6269 7473 2831 3435 2c20 3227 3030 3030 3031 3131 3131 3131 292e 0a62 6974 7328 3134 362c 2032 2730 3030 3030 3131 3131
1050140  3131 3129 2e0a 6269 7473 2831 3437 2c20 3227 3030 3030 3031 3131 3131 3131 292e 0a62 6974 7328 3134 382c 2032 2730 3030
1050220  3030 3131 3131 3131 3129 2e0a 6269 7473 2831 3439 2c20 3227 3030 3030 3031 3131 3131 3131 292e 0a62 6974 7328 3135 302c
1050300  2032 2730 3030 3030 3131 3131 3131 3129 2e0a 6269 7473 2831 3531 2c20 3227 3030 3030 3031 3131 3131 3131 292e 0a62 6974
1050360  7328 3135 322c 2032 2730 3030 3030 3131 3131 3131 3129 2e0a 6269 7473 2831 3533 2c20 3227 3030 3030 3031 3131 3131 3131
1050440  292e 0a62 6974 7328 3135 342c 2032 2730 3030 3030 3131 3131 3131 3129 2e0a 6269 7473 2831 3535 2c20 3227 3030 3030 3031
1050520  3131 3131 3131 292e 0a62 6974 7328 3135 362c 2032 2730 3030 3030 3131 3131 3131 3129 2e0a 6269 7473 2831 3537 2c20 3227
1050600  3030 3030 3031 3131 3131 3131 292e 0a62 6974 7328 3135 382c 2032 2730 3030 3030 3131 3131 3131 3129 2e0a 6269 7473 2831
1050660  3539 2c20 3227 3030 3030 3031 3131 3131 3131 292e 0a62 6974 7328 3136 302c 2032 2730 3030 3030 3131 3131 3131 3129 2e0a
1050740  6269 7473 2831 3631 2c20 3227 3030 3030 3030 3131 3131 3131 292e 0a62 6974 7328 3136 322c 2032 2730 3030 3030 3031 3131
1051020  3131 3129 2e0a 6269 7473 2831 3633 2c20 3227 3030 3030 3030 3131 3131 3131 292e 0a62 6974 7328 3136 342c 2032 2730 3030
1051100  3030 3031 3131 3131 3129 2e0a 6269 7473 2831 3635 2c20 3227 3030 3030 3030 3131 3131 3131 292e 0a62 6974 7328 3136 362c
1051160  2032 2730 3030 3030 3031 3131 3131 3129 2e0a 6269 7473 2831 3637 2c20 3227 3030 3030 3030 3131 3131 3131 292e 0a62 6974
1051240  7328 3136 382c 2032 2730 3030 3030 3031 3131 3131 3129 2e0a 6269 7473 2831 3639 2c20 3227 3030 3030 3030 3131 3131 3131
1051320  292e 0a62 6974 7328 3137 302c 2032 2730 3030 3030 3031 3131 3131 3129 2e0a 6269 7473 2831 3731 2c20 3227 3030 3030 3030
1051400  3131 3131 3131 292e 0a62 6974 7328 3137 322c 2032 2730 3030 3030 3031 3131 3131 3129 2e0a 6269 7473 2831 3733 2c20 3227
1051460  3030 3030 3030 3131 3131 3131 292e 0a62 6974 7328 3137 342c 2032 2730 3030 3030 3031 3131 3131 3129 2e0a 6269 7473 2831
1051540  3735 2c20 3227 3030 3030 3030 3131 3131 3131 292e 0a62 6974 7328 3137 362c 2032 2730 3030 3030 3031 3131 3131 3129 2e0a
1051620  6269 7473 2831 3737 2c20 3227 3030 3030 3030 3131 3131 3131 292e 0a62 6974 7328 3137 382c 2032 2730 3030 3030 3031 3131
1051700  3131 3129 2e0a 6269 7473 2831 3739 2c20 3227 3030 3030 3030 3131 3131 3131 292e 0a62 6974 7328 3138 302c 2032 2730 3030
1051760  3030 3031 3131 3131 3129 2e0a 6269 7473 2831 3831 2c20 3227 3030 3030 3030 3131 3131 3131 292e 0a62 6974 7328 3138 322c
1052040  2032 2730 3030 3030 3031 3131 3131 3129 2e0a 6269 7473 2831 3833 2c20 3227 3030 3030 3030 3131 3131 3131 292e 0a62 6974
1052120  7328 3138 342c 2032 2730 3030 3030 3031 3131 3131 3129 2e0a 6269 7473 2831 3835 2c20 3227 3030 3030 3030 3131 3131 3131
1052200  292e 0a62 6974 7328 3138 362c 2032 2730 3030 3030 3031 3131 3131 3129 2e0a 6269 7473 2831 3837 2c20 3227 3030 3030 3030
1052260  3131 3131 3131 292e 0a62 6974 7328 3138 382c 2032 2730 3030 3030 3031 3131 3131 3129 2e0a 6269 7473 2831 3839 2c20 3227
1052340  3030 3030 3030 3131 3131 3131 292e 0a62 6974 7328 3139 302c 2032 2730 3030 3030 3031 3131 3131 3129 2e0a 6269 7473 2831
1052420  3931 2c20 3227 3030 3030 3030 3131 3131 3131 292e 0a62 6974 7328 3139 322c 2032 2730 3031 3030 3031 3131 3131 3129 2e0a
1052500  6269 7473 2831 3933 2c20 3227 3030 3130 3030 3131 3131 3131 292e 0a62 6974 7328 3139 342c 2032 2730 3031 3030 3031 3131
1052560  3131 3129 2e0a 6269 7473 2831 3935 2c20 3227 3030 3130 3030 3131 3131 3131 292e 0a62 6974 7328 3139 362c 2032 2730 3031
1052640  3030 3031 3131 3131 3129 2e0a 6269 7473 2831 3937 2c20 3227 3030 3130 3030 3131 3131 3131 292e 0a62 6974 7328 3139 382c
1052720  2032 2730 3031 3030 3031 3131 3131 3129 2e0a 6269 7473 2831 3939 2c20 3227 3030 3130 3030 3131 3131 3131 292e 0a62 6974
1053000  7328 3230 302c 2032 2730 3031 3030 3031 3131 3131 3129 2e0a 6269 7473 2832 3031 2c20 3227 3030 3130 3030 3131 3131 3131
1053060  292e 0a62 6974 7328 3230 322c 2032 2730 3031 3030 3031 3131 3131 3129 2e0a 6269 7473 2832 3033 2c20 3227 3030 3130 3030
1053140  3131 3131 3131 292e 0a62 6974 7328 3230 342c 2032 2730 3031 3030 3031 3131 3131 3129 2e0a 6269 7473 2832 3035 2c20 3227
1053220  3030 3130 3030 3131 3131 3131 292e 0a62 6974 7328 3230 362c 2032 2730 3031 3030 3031 3131 3131 3129 2e0a 6269 7473 2832
1053300  3037 2c20 3227 3030 3130 3030 3131 3131 3131 292e 0a62 6974 7328 3230 382c 2032 2730 3031 3030 3031 3131 3131 3129 2e0a
```

| | | | | | | | | | | | | | | | | | | | | | | | | |
|---|---|---|---|---|---|---|---|---|---|---|---|---|---|---|---|---|---|---|---|---|---|---|---|---|
| 1053360 | 6269 | 7473 | 2832 | 3039 | 2c20 | 3227 | 3030 | 3130 | 3030 | 3131 | 3131 | 3131 | 292e | 0a62 | 6974 | 7328 | 3231 | 302c | 2032 | 2730 | 3031 | 3030 | 3031 | 3131 |
| 1053440 | 3131 | 3129 | 2e0a | 6269 | 7473 | 2832 | 3131 | 2c20 | 3227 | 3030 | 3130 | 3030 | 3131 | 3131 | 3131 | 292e | 0a62 | 6974 | 7328 | 3231 | 322c | 2032 | 2730 | 3031 |
| 1053520 | 3030 | 3031 | 3131 | 3131 | 3129 | 2e0a | 6269 | 7473 | 2832 | 3133 | 2c20 | 3227 | 3030 | 3130 | 3030 | 3131 | 3131 | 3131 | 292e | 0a62 | 6974 | 7328 | 3231 | 342c |
| 1053600 | 2032 | 2730 | 3031 | 3030 | 3031 | 3131 | 3131 | 3129 | 2e0a | 6269 | 7473 | 2832 | 3135 | 2c20 | 3227 | 3030 | 3130 | 3030 | 3131 | 3131 | 3131 | 292e | 0a62 | 6974 |
| 1053660 | 7328 | 3231 | 362c | 2032 | 2730 | 3031 | 3030 | 3031 | 3131 | 3131 | 3129 | 2e0a | 6269 | 7473 | 2832 | 3137 | 2c20 | 3227 | 3030 | 3130 | 3030 | 3131 | 3131 | 3131 |
| 1053740 | 292e | 0a62 | 6974 | 7328 | 3231 | 382c | 2032 | 2730 | 3031 | 3030 | 3031 | 3131 | 3131 | 3129 | 2e0a | 6269 | 7473 | 2832 | 3139 | 2c20 | 3227 | 3030 | 3130 | 3030 |
| 1054020 | 3131 | 3131 | 3131 | 292e | 0a62 | 6974 | 7328 | 3232 | 302c | 2032 | 2730 | 3031 | 3030 | 3031 | 3131 | 3131 | 3129 | 2e0a | 6269 | 7473 | 2832 | 3231 | 2c20 | 3227 |
| 1054100 | 3030 | 3130 | 3030 | 3131 | 3131 | 3131 | 292e | 0a62 | 6974 | 7328 | 3232 | 322c | 2032 | 2730 | 3031 | 3030 | 3031 | 3131 | 3131 | 3129 | 2e0a | 6269 | 7473 | 2832 |
| 1054160 | 3233 | 2c20 | 3227 | 3130 | 000c | 094c | 0300 | 1d17 | 0000 | 3287 | 0000 | 000c | 000c | 1570 | 000c | 1570 | 0041 | 0000 | 0000 | 0000 | 000b | 8878 | 0200 | 3ad7 |
| 1054240 | 0000 | 3287 | 0000 | 0008 | 000c | 1544 | 000c | 1544 | 0041 | 0000 | 0000 | 0000 | 000b | 88b8 | 0200 | 3adf | 0000 | 3287 | 0000 | 0008 | 000c | 1424 | 000c | 1424 |
| 1054320 | 0041 | 0000 | 0000 | 0000 | 000b | 88e8 | 0200 | 3ae7 | 0000 | 3287 | 0000 | 0008 | 000c | 1400 | 000c | 1400 | 0041 | 0000 | 0000 | 0000 | 0008 | e12c | 0100 | 3e87 |
| 1054400 | 0000 | 3e0f | 0000 | 0004 | 000c | 4574 | 000c | 4574 | 0001 | 004e | 0000 | 0000 | 0008 | e14c | 0100 | 3e8f | 0000 | 3e0f | 0000 | 0004 | 000c | 45bc | 000c | 45bc |
| 1054460 | 0001 | 004e | 0000 | 0000 | 0008 | e16c | 0100 | 3e97 | 0000 | 3e0f | 0000 | 0004 | 000c | 45e4 | 000c | 45e4 | 0001 | 004e | 0000 | 0000 | ffff | ffff | 0100 | 3e9f |
| 1054540 | 0000 | 3e0f | 0000 | 0004 | 000c | 4644 | 000c | 4644 | 0001 | 004e | 0000 | 0000 | 000b | 15ec | 0100 | 3ea7 | 0000 | 3e0f | 0000 | 0004 | 000c | 4664 | 000c | 4664 |
| 1054620 | 0001 | 004e | 0000 | 0000 | 0008 | e1ac | 0100 | 3eaf | 0000 | 3e0f | 0000 | 0004 | 000c | 468c | 000c | 468c | 0001 | 004e | 0000 | 0000 | 0008 | e1cc | 0100 | 3eb7 |
| 1054700 | 0000 | 3e0f | 0000 | 0004 | 000c | 46b4 | 000c | 46b4 | 0001 | 004e | 0000 | 0000 | 0008 | e1ec | 0100 | 3ebf | 0000 | 3e0f | 0000 | 0004 | 000c | 46dc | 000c | 46dc |
| 1054760 | 0001 | 004e | 0000 | 0000 | 000c | 4268 | 0200 | 3ebf | 0000 | 3e0f | 0000 | 0008 | 000b | 0064 | 000b | 0064 | 0001 | 004e | 0000 | 0000 | 000c | 4288 | 0300 | 3ebf |
| 1055040 | 0000 | 3e0f | 0000 | 000c | 000b | 0120 | 000b | 0120 | 0001 | 004e | 0000 | 0000 | 0008 | b7cc | 0100 | 3ec7 | 0000 | 3e0f | 0000 | 0004 | 000c | 4704 | 000c | 4704 |
| 1055120 | 0001 | 004e | 0000 | 0000 | 0008 | e22c | 0100 | 3ecf | 0000 | 3e0f | 0000 | 0004 | 000c | 4728 | 000c | 4728 | 0001 | 004e | 0000 | 0000 | ffff | ffff | 0100 | 3ed7 |
| 1055200 | 0000 | 3e0f | 0000 | 0004 | 000c | 4744 | 000c | 4744 | 0001 | 004e | 0000 | 0000 | 0008 | e24c | 0100 | 3edf | 0000 | 3e0f | 0000 | 0004 | 000c | 476c | 000c | 476c |
| 1055260 | 0001 | 004e | 0000 | 0000 | ffff | ffff | 0100 | 3ee7 | 0000 | 3e0f | 0000 | 0004 | 000c | 4794 | 000c | 4794 | 0001 | 004e | 0000 | 0000 | ffff | ffff | 0100 | 3eef |
| 1055340 | 0000 | 3e0f | 0000 | 0004 | 000c | 47d0 | 000c | 47d0 | 0001 | 004e | 0000 | 0000 | 0008 | e28c | 0100 | 3ef7 | 0000 | 3e0f | 0000 | 0004 | 000c | 4808 | 000c | 4808 |
| 1055420 | 0001 | 004e | 0000 | 0000 | ffff | ffff | 0200 | 3eff | 0000 | 3e0f | 0000 | 0008 | 000c | 4848 | 000c | 4848 | 0001 | 004e | 0000 | 0000 | ffff | ffff | 0100 | 3f07 |
| 1055500 | 0000 | 3e0f | 0000 | 0004 | 000c | 48cc | 000c | 48cc | 0001 | 004e | 0000 | 0000 | ffff | ffff | 0100 | 3f0f | 0000 | 3e0f | 0000 | 0004 | 000c | 4938 | 000c | 4938 |
| 1055560 | 0001 | 004e | 0000 | 0000 | 0008 | b7ec | 0100 | 3f17 | 0000 | 3e0f | 0000 | 0004 | 000c | 4970 | 000c | 4970 | 0001 | 004e | 0000 | 0000 | 0008 | e2cc | 0100 | 3f1f |
| 1055640 | 0000 | 3e0f | 0000 | 0004 | 000c | 49bc | 000c | 49bc | 0001 | 004e | 0000 | 0000 | ffff | ffff | 0100 | 3f27 | 0000 | 3e0f | 0000 | 0004 | 000c | 4a28 | 000c | 4a28 |
| 1055720 | 0001 | 004e | 0000 | 0000 | 0008 | e32c | 0100 | 3f2f | 0000 | 3e0f | 0000 | 0004 | 000c | 4a60 | 000c | 4a60 | 0001 | 004e | 0000 | 0000 | 0008 | e34c | 0100 | 3f37 |
| 1056000 | 0000 | 3e0f | 0000 | 0004 | 000c | 4aac | 000c | 4aac | 0001 | 004e | 0000 | 0000 | ffff | ffff | 0200 | 3f3f | 0000 | 3e0f | 0000 | 0008 | 000b | 052c | 000b | 052c |
| 1056060 | 0001 | 004e | 0000 | 0000 | 0008 | b86c | 0200 | 3f47 | 0000 | 3e0f | 0000 | 0008 | 000b | 0594 | 000b | 0594 | 0001 | 004e | 0000 | 0000 | 001d | 2240 | 2823 | 2938 |
| 1056140 | 392f | 3038 | 2f32 | 3820 | 6374 | 7970 | 6573 | 2e70 | 6c09 | 3333 | 2e31 | 2200 | 000c | 0160 | 0100 | 2def | 0000 | 3e0f | 0000 | 0004 | 000c | 4550 | 000c | 4550 |
| 1056220 | 0001 | 004e | 0000 | 0000 | 0000 | 0028 | 000c | 04cc | b27c | b65c | 0000 | 0223 | 7fff | ffff | 000c | 8998 | 0200 | 0db5 | 0100 | 32b5 | 0000 | 3e0f | 0000 | 315f |
| 1056300 | 2cac | 455e | 0002 | 438a | 2ca0 | 0ab7 | 0000 | 0000 | 0000 | 0001 | 000a | d3c8 | 000a | d3c8 | 0002 | 438a | 000c | 1470 | 2c78 | 0026 | 0002 | 438a | 2520 | 3310 |
| 1056360 | 24d0 | 0000 | 000c | 45ac | 0010 | aa18 | aab4 | 0f00 | 9f24 | aab4 | 0000 | a260 | 22a0 | 459e | ffff | ffff | 0200 | 3f57 | 0000 | 3e0f | 0000 | 0008 | 000c | 4b68 |
| 1056440 | 000c | 4b68 | 0001 | 004e | 0000 | 0000 | 2c78 | 0026 | 0002 | 438a | 2520 | 3310 | 24d0 | 0000 | 000c | 45ac | 0010 | aa18 | aab4 | 0e00 | 9f24 | aab4 | 0000 | a260 |
| 1056520 | 22a0 | 0ab7 | 2c78 | 0020 | 0002 | 438a | 4268 | 0000 | 0000 | 03fb | 4254 | 0000 | 0000 | 0003 | 239c | 0000 | 000c | 4614 | ffff | ffff | 0300 | 3f5f | 0000 | 3e0f |
| 1056600 | 0000 | 000c | 000b | 05fc | 000b | 05fc | 0001 | 004e | 0000 | 0000 | 0008 | b8cc | 0300 | 3f67 | 0000 | 3e0f | 0000 | 000c | 000c | 1fa4 | 000c | 4b24 | 0001 | 004e |
| 1056660 | 0000 | 0000 | 2c78 | 0020 | 0002 | 438a | 4268 | 0000 | 0000 | 07fb | 4254 | 0000 | 0000 | 0003 | 239c | 0000 | 000c | 4614 | 2c78 | 0026 | 0002 | 438a | 2520 | 3310 |
| 1056740 | 24d0 | 0000 | 000c | 45ac | 0010 | aa18 | aab4 | 0040 | 9f24 | aab4 | 0000 | a260 | 22a0 | 468e | 2c78 | 0026 | 0002 | 438a | 2520 | 3310 | 24d0 | 0000 | 000c | 45ac |
| 1057020 | 0010 | aa18 | aab4 | 1f00 | 9f24 | aab4 | 0000 | a260 | 22a0 | 0ab7 | 2c78 | 0026 | 0002 | 438a | 2520 | 3310 | 24d0 | 0000 | 000c | 45ac | 0010 | aa18 | aab4 | 1e00 |
| 1057100 | 9f24 | aab4 | 0000 | a260 | 22a0 | 46de | 2c78 | 0026 | 0002 | 438a | 2520 | 3310 | 24d0 | 0000 | 000c | 45ac | 0010 | aa18 | aab4 | 0100 | 9f24 | aab4 | 0000 | a260 |
| 1057160 | 22a0 | 0ab7 | 2cac | 46fd | 0002 | 438a | 2ca0 | 0abf | 0000 | 0000 | 0000 | 0001 | 000c | 161c | 000c | 161c | 0002 | 438a | 000c | 196c | 2c78 | 001a | 0002 | 438a |
| 1057240 | a858 | aab4 | 0020 | a354 | a858 | aab4 | 0009 | a260 | 228c | 4746 | 2c78 | 0026 | 0002 | 438a | 2520 | 3310 | 24d0 | 0000 | 000c | 45ac | 0010 | aa18 | aab4 | 00c0 |
| 1057320 | 9f24 | aab4 | 0000 | a168 | 22a0 | 0ab7 | 2c78 | 0026 | 0002 | 438a | 2520 | 3310 | 24d0 | 0000 | 000c | 45ac | 0010 | aa18 | aab4 | 00c0 | 9f24 | aab4 | 0000 | a260 |
| 1057400 | 22a0 | 479e | 2c78 | 0026 | 0002 | 438a | 2520 | 3310 | 24d0 | 0000 | 000c | 45ac | 0010 | aa18 | aab4 | 0400 | 9f24 | aab4 | 0000 | a260 | 22a0 | 47be | 2c78 | 0012 |
| 1057460 | 0002 | 438a | 4e1c | 0000 | 0000 | 0053 | 228c | 1d8f | 2cac | 3a17 | 0002 | 438a | 2ca0 | 47de | 0000 | 0000 | 0000 | 0001 | 000c | 47bc | 000c | 47bc | 0002 | 438a |
| 1057540 | 000c | 1980 | 2c78 | 0012 | 0002 | 438a | 4e1c | 0000 | 0000 | 0063 | 228c | 47fd | 2cac | 480e | 0002 | 438a | 2ca0 | 481e | 0000 | 0000 | 0000 | 0001 | 000c | 47f4 |
| 1057620 | 000c | 47f4 | 0002 | 438a | 000c | 482c | 000c | 4800 | 27f0 | 0018 | 000c | 4870 | 4e1c | 0000 | 0000 | 0143 | 52c4 | 0000 | 0000 | 014b | 2cac | 0a37 | 0002 | 438a |
| 1057700 | 2ca0 | 4856 | 0000 | 000c | 0000 | 0004 | 000c | 4830 | 000c | 48a0 | 0002 | 438a | 000c | 1a84 | 000c | 8a74 | 28c4 | 0018 | 000c | 4888 | 4e1c | 0000 | 0000 | 02db |
| 1057760 | 52c4 | 0000 | 0000 | 02eb | 28c4 | 0018 | 000c | 48a0 | 4e1c | 0000 | 0000 | 03db | 52c4 | 0000 | 0000 | 03eb | 2954 | 0018 | 0002 | 438a | 4e1c | 0000 | 0000 | 055b |
| 1060040 | 52c4 | 0000 | 0000 | 05db | 27f0 | 0012 | 000c | 48f0 | 4e1c | 0000 | 0000 | 0173 | 228c | 48d6 | 2cac | 1d8f | 0002 | 438a | 2ca0 | 48cd | 0000 | 000c | 0000 | 0003 |
| 1060120 | 000c | 48b8 | 000c | 4904 | 0002 | 438a | 000c | 4918 | 28c4 | 0012 | 000c | 4904 | 4e1c | 0000 | 0000 | 01fb | 228c | 0ab7 | 2954 | 0012 | 0002 | 438a | 4e1c | 0000 |
| 1060200 | 0000 | 010b | 228c | 148f | 0000 | 0000 | 000c | 4910 | 000c | 48c4 | 000c | 48fc | 0000 | 3e17 | b328 | 1d8f | 000c | 899c | 0000 | 0000 | 2c78 | 0026 | 0002 | 438a |
| 1060260 | 2520 | 3310 | 24d0 | 0000 | 000c | 45ac | 0010 | aa18 | aab4 | 0040 | 9f24 | aab4 | 0000 | a168 | 22a0 | 0a0f | 000d | 6361 | 6e5f | 6f70 | 656e | 5f66 | 696c | 6500 |
| 1060340 | 2c78 | 0026 | 0002 | 438a | 2520 | 3310 | 24d0 | 0000 | 000c | 45ac | 0010 | aa18 | aab4 | 07c0 | 9f24 | aab4 | 0000 | a168 | 22a0 | 1d8f | 000a | 6765 | 745f | 6c69 |
| 1060420 | 6e65 | 5f31 | 0000 | 0000 | 27f0 | 0012 | 000c | 49e0 | 4e1c | 0000 | 0000 | 013b | 228c | 49be | 2cac | 0abf | 0002 | 438a | 2ca0 | 1d8f | 0000 | 000c | 0000 | 0003 |

```
1060500  000c 49a8 000c 49f4 0002 438a 000c 4a08 28c4 0012 000c 49f4 4e1c 0000 0000 0113 228c 49f6 2954 0012 0002 438a 4e1c 0000
1060560  0000 0303 228c 49fd 000c 4a00 0000 0000 000c 49ec 000c 49b4 0000 3f97 b328 4a15 000c 2308 0000 0000 2c78 0026 0002 438a
1060640  2520 3310 24d0 0000 000c 45ac 0010 aa18 aab4 0080 9f24 aab4 0000 a260 22a0 1d8f 0000 3f8f b328 4a4d 000c 22d4 0000 0000
1060720  2c78 0026 0002 438a 2520 3310 24d0 0000 000c 45ac 0010 aa18 aab4 0200 9f24 aab4 0000 a260 22a0 4a7d 0000 3f87 b328 0a7f
1061000  000c 22a0 0000 0000 27f0 0012 000c 4ad0 4e1c 0000 0000 0103 228c 4a95 2cac 315f 0002 438a 2ca0 4abd 0000 0004 0000 0002
1061060  000c 4a98 000c 4ad0 0002 438a 000b 0024 2954 0012 0002 438a 4e1c 0000 0000 004b 229c 4acd 0000 3e17 b328 0000 000c 21a4
1061140  0000 0000 0000 3f7f b464 2817 000c 2204 000c 1eb4 0000 3f77 b464 0ab7 000c 21d0 000c 1ea8 0000 3e5f b328 4b05 000c 2138
1061220  0000 0000 2954 001c 0002 438a a858 aaf0 0001 ac08 a858 a874 a538 22bc 000c 4634 0000 3e5f b328 0ab7 000c 210c 0000 0000
1061300  27f0 0018 000c 4b8c 4e1c 0000 0000 0003 52c4 0000 0000 03fb 2cac 0db7 0002 438a 2ca0 315f 0000 03fc 0000 0100 000c 4b50
1061360  000c 638c 0002 438a 000b 0a60 28c4 0018 000c 4ba4 4e1c 0000 0000 000b 52c4 0000 0000 03fb 28c4 0018 000c 4bcc 4e1c 0000
1061440  0000 0013 52c4 0000 0000 03fb 2c78 0010 0002 438a 239c 0000 000c 4198 28c4 0018 000c 4be4 4e1c 0000 0000 001b 52c4 0000
1061520  0000 03fb 28c4 0018 000c 4c1c 4e1c 0000 0000 0023 52c4 0000 0000 03fb 000c 41a8 0100 3e8f 0000 3287 0000 0004 000c 63a4
1061600  000c 63a4 0041 0000 0000 0000 28c4 0018 000c 4c34 4e1c 0000 0000 002b 52c4 0000 0000 03fb 28c4 0018 000c 4c4c 4e1c 0000
1061660  0000 0033 52c4 0000 0000 03fb 28c4 0018 000c 4c64 4e1c 0000 0000 003b 52c4 0000 0000 03fb 28c4 0018 000c 4c7c 4e1c 0000
1061740  0000 0043 52c4 0000 0000 03fb 28c4 0018 000c 4c94 4e1c 0000 0000 004b 52c4 0000 0000 07fb 28c4 0018 000c 4cac 4e1c 0000
1062020  0000 0053 52c4 0000 0000 07fb 28c4 0018 000c 4cc4 4e1c 0000 0000 005b 52c4 0000 0000 07fb 28c4 0018 000c 4cdc 4e1c 0000
1062100  0000 0063 52c4 0000 0000 07fb 28c4 0018 000c 4cf4 4e1c 0000 0000 006b 52c4 0000 0000 07fb 28c4 0018 000c 4d0c 4e1c 0000
1062160  0000 0073 52c4 0000 0000 03fb 28c4 0018 000c 4d24 4e1c 0000 0000 007b 52c4 0000 0000 03fb 28c4 0018 000c 4d3c 4e1c 0000
1062240  0000 0083 52c4 0000 0000 03fb 28c4 0018 000c 4d54 4e1c 0000 0000 008b 52c4 0000 0000 03fb 28c4 0018 000c 4d6c 4e1c 0000
1062320  0000 0093 52c4 0000 0000 03fb 28c4 0018 000c 4d84 4e1c 0000 0000 009b 52c4 0000 0000 03fb 28c4 0018 000c 4d9c 4e1c 0000
1062400  0000 00a3 52c4 0000 0000 03fb 28c4 0018 000c 4db4 4e1c 0000 0000 00ab 52c4 0000 0000 03fb 28c4 0018 000c 4dcc 4e1c 0000
1062460  0000 00b3 52c4 0000 0000 03fb 28c4 0018 000c 4de4 4e1c 0000 0000 00bb 52c4 0000 0000 03fb 28c4 0018 000c 4dfc 4e1c 0000
1062540  0000 00c3 52c4 0000 0000 03fb 28c4 0018 000c 4e14 4e1c 0000 0000 00cb 52c4 0000 0000 03fb 28c4 0018 000c 4e2c 4e1c 0000
1062620  0000 00d3 52c4 0000 0000 03fb 28c4 0018 000c 4e44 4e1c 0000 0000 00db 52c4 0000 0000 03fb 28c4 0018 000c 4e5c 4e1c 0000
1062700  0000 00e3 52c4 0000 0000 03fb 28c4 0018 000c 4e74 4e1c 0000 0000 00eb 52c4 0000 0000 03fb 28c4 0018 000c 4e8c 4e1c 0000
1062760  0000 00f3 52c4 0000 0000 03fb 28c4 0018 000c 4ea4 4e1c 0000 0000 00fb 52c4 0000 0000 07fb 28c4 0018 000c 4ebc 4e1c 0000
1063040  0000 0103 52c4 0000 0000 05fb 28c4 0018 000c 4ed4 4e1c 0000 0000 010b 52c4 0000 0000 01fb 28c4 0018 000c 4eec 4e1c 0000
1063120  0000 0113 52c4 0000 0000 01fb 28c4 0018 000c 4f04 4e1c 0000 0000 011b 52c4 0000 0000 01fb 28c4 0018 000c 4f1c 4e1c 0000
1063200  0000 0123 52c4 0000 0000 01fb 28c4 0018 000c 4f34 4e1c 0000 0000 012b 52c4 0000 0000 01fb 28c4 0018 000c 4f4c 4e1c 0000
1063260  0000 0133 52c4 0000 0000 01fb 28c4 0018 000c 4f64 4e1c 0000 0000 013b 52c4 0000 0000 01fb 28c4 0018 000c 4f7c 4e1c 0000
1063340  0000 0143 52c4 0000 0000 01fb 28c4 0018 000c 4f94 4e1c 0000 0000 014b 52c4 0000 0000 01fb 28c4 0018 000c 4fac 4e1c 0000
1063420  0000 0153 52c4 0000 0000 01fb 28c4 0018 000c 4fc4 4e1c 0000 0000 015b 52c4 0000 0000 01fb 28c4 0018 000c 4fdc 4e1c 0000
1063500  0000 0163 52c4 0000 0000 01fb 28c4 0018 000c 4ff4 4e1c 0000 0000 016b 52c4 0000 0000 01fb 28c4 0018 000c 500c 4e1c 0000
1063560  0000 0173 52c4 0000 0000 01fb 28c4 0018 000c 5024 4e1c 0000 0000 017b 52c4 0000 0000 01fb 28c4 0018 000c 503c 4e1c 0000
1063640  0000 0183 52c4 0000 0000 0803 28c4 0018 000c 5054 4e1c 0000 0000 018b 52c4 0000 0000 080b 28c4 0018 000c 506c 4e1c 0000
1063720  0000 0193 52c4 0000 0000 0813 28c4 0018 000c 5084 4e1c 0000 0000 019b 52c4 0000 0000 081b 28c4 0018 000c 509c 4e1c 0000
1064000  0000 01a3 52c4 0000 0000 0823 28c4 0018 000c 50b4 4e1c 0000 0000 01ab 52c4 0000 0000 082b 28c4 0018 000c 50cc 4e1c 0000
1064060  0000 01b3 52c4 0000 0000 0833 28c4 0018 000c 50e4 4e1c 0000 0000 01bb 52c4 0000 0000 083b 28c4 0018 000c 50fc 4e1c 0000
1064140  0000 01c3 52c4 0000 0000 0843 28c4 0018 000c 5114 4e1c 0000 0000 01cb 52c4 0000 0000 084b 28c4 0018 000c 512c 4e1c 0000
1064220  0000 01d3 52c4 0000 0000 01fb 28c4 0018 000c 5144 4e1c 0000 0000 01db 52c4 0000 0000 01fb 28c4 0018 000c 515c 4e1c 0000
1064300  0000 01e3 52c4 0000 0000 01fb 28c4 0018 000c 5174 4e1c 0000 0000 01eb 52c4 0000 0000 01fb 28c4 0018 000c 518c 4e1c 0000
1064360  0000 01f3 52c4 0000 0000 01fb 28c4 0018 000c 51a4 4e1c 0000 0000 01fb 52c4 0000 0000 01fb 28c4 0018 000c 51bc 4e1c 0000
1064440  0000 0203 52c4 0000 0000 01fb 28c4 0018 000c 51d4 4e1c 0000 0000 020b 52c4 0000 0000 1053 28c4 0018 000c 51ec 4e1c 0000
1064520  0000 0213 52c4 0000 0000 105b 28c4 0018 000c 5204 4e1c 0000 0000 021b 52c4 0000 0000 1063 28c4 0018 000c 521c 4e1c 0000
1064600  0000 0223 52c4 0000 0000 106b 28c4 0018 000c 5234 4e1c 0000 0000 022b 52c4 0000 0000 1073 28c4 0018 000c 524c 4e1c 0000
1064660  0000 0233 52c4 0000 0000 107b 28c4 0018 000c 5264 4e1c 0000 0000 023b 52c4 0000 0000 1083 28c4 0018 000c 527c 4e1c 0000
1064740  0000 0243 52c4 0000 0000 108b 28c4 0018 000c 5294 4e1c 0000 0000 024b 52c4 0000 0000 1093 28c4 0018 000c 52ac 4e1c 0000
1065020  0000 0253 52c4 0000 0000 109b 28c4 0018 000c 52c4 4e1c 0000 0000 025b 52c4 0000 0000 10a3 28c4 0018 000c 52dc 4e1c 0000
1065100  0000 0263 52c4 0000 0000 10ab 28c4 0018 000c 52f4 4e1c 0000 0000 026b 52c4 0000 0000 10b3 28c4 0018 000c 530c 4e1c 0000
1065160  0000 0273 52c4 0000 0000 10bb 28c4 0018 000c 5324 4e1c 0000 0000 027b 52c4 0000 0000 10c3 28c4 0018 000c 533c 4e1c 0000
1065240  0000 0283 52c4 0000 0000 10cb 28c4 0018 000c 5354 4e1c 0000 0000 028b 52c4 0000 0000 10d3 28c4 0018 000c 536c 4e1c 0000
1065320  0000 0293 52c4 0000 0000 10db 28c4 0018 000c 5384 4e1c 0000 0000 029b 52c4 0000 0000 10e3 28c4 0018 000c 539c 4e1c 0000
1065400  0000 02a3 52c4 0000 0000 10eb 28c4 0018 000c 53b4 4e1c 0000 0000 02ab 52c4 0000 0000 10f3 28c4 0018 000c 53cc 4e1c 0000
1065460  0000 02b3 52c4 0000 0000 10fb 28c4 0018 000c 53e4 4e1c 0000 0000 02bb 52c4 0000 0000 1103 28c4 0018 000c 53fc 4e1c 0000
1065540  0000 02c3 52c4 0000 0000 110b 28c4 0018 000c 5414 4e1c 0000 0000 02cb 52c4 0000 0000 1113 28c4 0018 000c 542c 4e1c 0000
```

```
1065620  0000 02d3 52c4 0000 0000 111b 28c4 0018 000c 5444 4e1c 0000 0000 02db 52c4 0000 0000 01fb 28c4 0018 000c 545c 4e1c 0000
1065700  0000 02e3 52c4 0000 0000 01fb 28c4 0018 000c 5474 4e1c 0000 0000 02eb 52c4 0000 0000 01fb 28c4 0018 000c 548c 4e1c 0000
1065760  0000 02f3 52c4 0000 0000 01fb 28c4 0018 000c 54a4 4e1c 0000 0000 02fb 52c4 0000 0000 81fb 28c4 0018 000c 54bc 4e1c 0000
1066040  0000 0303 52c4 0000 0000 01fb 28c4 0018 000c 54d4 4e1c 0000 0000 030b 52c4 0000 0000 2053 28c4 0018 000c 54ec 4e1c 0000
1066120  0000 0313 52c4 0000 0000 205b 28c4 0018 000c 5504 4e1c 0000 0000 031b 52c4 0000 0000 2063 28c4 0018 000c 551c 4e1c 0000
1066200  0000 0323 52c4 0000 0000 206b 28c4 0018 000c 5534 4e1c 0000 0000 032b 52c4 0000 0000 2073 28c4 0018 000c 554c 4e1c 0000
1066260  0000 0333 52c4 0000 0000 207b 28c4 0018 000c 5564 4e1c 0000 0000 033b 52c4 0000 0000 2083 28c4 0018 000c 557c 4e1c 0000
1066340  0000 0343 52c4 0000 0000 208b 28c4 0018 000c 5594 4e1c 0000 0000 034b 52c4 0000 0000 2093 28c4 0018 000c 55ac 4e1c 0000
1066420  0000 0353 52c4 0000 0000 209b 28c4 0018 000c 55c4 4e1c 0000 0000 035b 52c4 0000 0000 20a3 28c4 0018 000c 55dc 4e1c 0000
1066500  0000 0363 52c4 0000 0000 20ab 28c4 0018 000c 55f4 4e1c 0000 0000 036b 52c4 0000 0000 20b3 28c4 0018 000c 560c 4e1c 0000
1066560  0000 0373 52c4 0000 0000 20bb 28c4 0018 000c 5624 4e1c 0000 0000 037b 52c4 0000 0000 20c3 28c4 0018 000c 563c 4e1c 0000
1066640  0000 0383 52c4 0000 0000 20cb 28c4 0018 000c 5654 4e1c 0000 0000 038b 52c4 0000 0000 20d3 28c4 0018 000c 566c 4e1c 0000
1066720  0000 0393 52c4 0000 0000 20db 28c4 0018 000c 5684 4e1c 0000 0000 039b 52c4 0000 0000 20e3 28c4 0018 000c 569c 4e1c 0000
1067000  0000 03a3 52c4 0000 0000 20eb 28c4 0018 000c 56b4 4e1c 0000 0000 03ab 52c4 0000 0000 20f3 28c4 0018 000c 56cc 4e1c 0000
1067060  0000 03b3 52c4 0000 0000 20fb 28c4 0018 000c 56e4 4e1c 0000 0000 03bb 52c4 0000 0000 2103 28c4 0018 000c 56fc 4e1c 0000
1067140  0000 03c3 52c4 0000 0000 210b 28c4 0018 000c 5714 4e1c 0000 0000 03cb 52c4 0000 0000 2113 28c4 0018 000c 572c 4e1c 0000
1067220  0000 03d3 52c4 0000 0000 211b 28c4 0018 000c 5744 4e1c 0000 0000 03db 52c4 0000 0000 01fb 28c4 0018 000c 575c 4e1c 0000
1067300  0000 03e3 52c4 0000 0000 01fb 28c4 0018 000c 5774 4e1c 0000 0000 03eb 52c4 0000 0000 01fb 28c4 0018 000c 578c 4e1c 0000
1067360  0000 03f3 52c4 0000 0000 01fb 28c4 0018 000c 57a4 4e1c 0000 0000 03fb 52c4 0000 0000 03fb 28c4 0018 000c 57bc 4e1c 0000
1067440  0000 0403 52c4 0000 0000 03fb 28c4 0018 000c 57d4 4e1c 0000 0000 040b 52c4 0000 0000 03fb 28c4 0018 000c 57ec 4e1c 0000
1067520  0000 0413 52c4 0000 0000 03fb 28c4 0018 000c 5804 4e1c 0000 0000 041b 52c4 0000 0000 03fb 28c4 0018 000c 581c 4e1c 0000
1067600  0000 0423 52c4 0000 0000 03fb 28c4 0018 000c 5834 4e1c 0000 0000 042b 52c4 0000 0000 03fb 28c4 0018 000c 584c 4e1c 0000
1067660  0000 0433 52c4 0000 0000 03fb 28c4 0018 000c 5864 4e1c 0000 0000 043b 52c4 0000 0000 03fb 28c4 0018 000c 587c 4e1c 0000
1067740  0000 0443 52c4 0000 0000 03fb 28c4 0018 000c 5894 4e1c 0000 0000 044b 52c4 0000 0000 03fb 28c4 0018 000c 58ac 4e1c 0000
1070020  0000 0453 52c4 0000 0000 03fb 28c4 0018 000c 58c4 4e1c 0000 0000 045b 52c4 0000 0000 03fb 28c4 0018 000c 58dc 4e1c 0000
1070100  0000 0463 52c4 0000 0000 03fb 28c4 0018 000c 58f4 4e1c 0000 0000 046b 52c4 0000 0000 03fb 28c4 0018 000c 590c 4e1c 0000
1070160  0000 0473 52c4 0000 0000 03fb 28c4 0018 000c 5924 4e1c 0000 0000 047b 52c4 0000 0000 03fb 28c4 0018 000c 593c 4e1c 0000
1070240  0000 0483 52c4 0000 0000 03fb 28c4 0018 000c 5954 4e1c 0000 0000 048b 52c4 0000 0000 03fb 28c4 0018 000c 596c 4e1c 0000
1070320  0000 0493 52c4 0000 0000 03fb 28c4 0018 000c 5984 4e1c 0000 0000 049b 52c4 0000 0000 03fb 28c4 0018 000c 599c 4e1c 0000
1070400  0000 04a3 52c4 0000 0000 03fb 28c4 0018 000c 59b4 4e1c 0000 0000 04ab 52c4 0000 0000 03fb 28c4 0018 000c 59cc 4e1c 0000
1070460  0000 04b3 52c4 0000 0000 03fb 28c4 0018 000c 59e4 4e1c 0000 0000 04bb 52c4 0000 0000 03fb 28c4 0018 000c 59fc 4e1c 0000
1070540  0000 04c3 52c4 0000 0000 03fb 28c4 0018 000c 5a14 4e1c 0000 0000 04cb 52c4 0000 0000 03fb 28c4 0018 000c 5a2c 4e1c 0000
1070620  0000 04d3 52c4 0000 0000 03fb 28c4 0018 000c 5a44 4e1c 0000 0000 04db 52c4 0000 0000 03fb 28c4 0018 000c 5a5c 4e1c 0000
1070700  0000 04e3 52c4 0000 0000 03fb 28c4 0018 000c 5a74 4e1c 0000 0000 04eb 52c4 0000 0000 03fb 28c4 0018 000c 5a8c 4e1c 0000
1070760  0000 04f3 52c4 0000 0000 03fb 28c4 0018 000c 5aa4 4e1c 0000 0000 04fb 52c4 0000 0000 03fb 28c4 0018 000c 5abc 4e1c 0000
1071040  0000 0503 52c4 0000 0000 03fb 28c4 0018 000c 5ad4 4e1c 0000 0000 050b 52c4 0000 0000 01fb 28c4 0018 000c 5aec 4e1c 0000
1071120  0000 0513 52c4 0000 0000 01fb 28c4 0018 000c 5b04 4e1c 0000 0000 051b 52c4 0000 0000 01fb 28c4 0018 000c 5b1c 4e1c 0000
1071200  0000 0523 52c4 0000 0000 01fb 28c4 0018 000c 5b34 4e1c 0000 0000 052b 52c4 0000 0000 01fb 28c4 0018 000c 5b4c 4e1c 0000
1071260  0000 0533 52c4 0000 0000 01fb 28c4 0018 000c 5b64 4e1c 0000 0000 053b 52c4 0000 0000 01fb 28c4 0018 000c 5b7c 4e1c 0000
1071340  0000 0543 52c4 0000 0000 01fb 28c4 0018 000c 5b94 4e1c 0000 0000 054b 52c4 0000 0000 01fb 28c4 0018 000c 5bac 4e1c 0000
1071420  0000 0553 52c4 0000 0000 01fb 28c4 0018 000c 5bc4 4e1c 0000 0000 055b 52c4 0000 0000 01fb 28c4 0018 000c 5bdc 4e1c 0000
1071500  0000 0563 52c4 0000 0000 01fb 28c4 0018 000c 5bf4 4e1c 0000 0000 056b 52c4 0000 0000 01fb 28c4 0018 000c 5c0c 4e1c 0000
1071560  0000 0573 52c4 0000 0000 01fb 28c4 0018 000c 5c24 4e1c 0000 0000 057b 52c4 0000 0000 01fb 28c4 0018 000c 5c3c 4e1c 0000
1071640  0000 0583 52c4 0000 0000 01fb 28c4 0018 000c 5c54 4e1c 0000 0000 058b 52c4 0000 0000 01fb 28c4 0018 000c 5c6c 4e1c 0000
1071720  0000 0593 52c4 0000 0000 01fb 28c4 0018 000c 5c84 4e1c 0000 0000 059b 52c4 0000 0000 01fb 28c4 0013 000c 5c9c 4e1c 0000
1072000  0000 05a3 52c4 0000 0000 01fb 28c4 0018 000c 5cb4 4e1c 0000 0000 05ab 52c4 0000 0000 01fb 28c4 0018 000c 5ccc 4e1c 0000
1072060  0000 05b3 52c4 0000 0000 01fb 28c4 0018 000c 5ce4 4e1c 0000 0000 05bb 52c4 0000 0000 01fb 28c4 0018 000c 5cfc 4e1c 0000
1072140  0000 05c3 52c4 0000 0000 01fb 28c4 0018 000c 5d14 4e1c 0000 0000 05cb 52c4 0000 0000 01fb 28c4 0018 000c 5d2c 4e1c 0000
1072220  0000 05d3 52c4 0000 0000 01fb 28c4 0018 000c 5d44 4e1c 0000 0000 05db 52c4 0000 0000 01fb 28c4 0018 000c 5d5c 4e1c 0000
1072300  0000 05e3 52c4 0000 0000 01fb 28c4 0018 000c 5d74 4e1c 0000 0000 05eb 52c4 0000 0000 01fb 28c4 0018 000c 5d8c 4e1c 0000
1072360  0000 05f3 52c4 0000 0000 01fb 28c4 0018 000c 5da4 4e1c 0000 0000 05fb 52c4 0000 0000 01fb 28c4 0018 000c 5dbc 4e1c 0000
1072440  0000 0603 52c4 0000 0000 11fb 28c4 0018 000c 5dd4 4e1c 0000 0000 060b 52c4 0000 0000 11fb 28c4 0018 000c 5dec 4e1c 0000
1072520  0000 0613 52c4 0000 0000 11fb 28c4 0018 000c 5e04 4e1c 0000 0000 061b 52c4 0000 0000 11fb 28c4 0018 000c 5e1c 4e1c 0000
1072600  0000 0623 52c4 0000 0000 11fb 28c4 0018 000c 5e34 4e1c 0000 0000 062b 52c4 0000 0000 11fb 28c4 0018 000c 5e4c 4e1c 0000
1072660  0000 0633 52c4 0000 0000 11fb 28c4 0018 000c 5e64 4e1c 0000 0000 063b 52c4 0000 0000 11fb 28c4 0018 000c 5e7c 4e1c 0000
```

```
1072740  0000 0643 52c4 0000 0000 11fb 28c4 0018 000c 5e94 4e1c 0000 0000 064b 52c4 0000 0000 11fb 28c4 0018 000c 5eac 4e1c 0000
1073020  0000 0653 52c4 0000 0000 11fb 28c4 0018 000c 5ec4 4e1c 0000 0000 065b 52c4 0000 0000 11fb 28c4 0018 000c 5edc 4e1c 0000
1073100  0000 0663 52c4 0000 0000 11fb 28c4 0018 000c 5ef4 4e1c 0000 0000 066b 52c4 0000 0000 11fb 28c4 0018 000c 5f0c 4e1c 0000
1073160  0000 0673 52c4 0000 0000 11fb 28c4 0018 000c 5f24 4e1c 0000 0000 067b 52c4 0000 0000 11fb 28c4 0018 000c 5f3c 4e1c 0000
1073240  0000 0683 52c4 0000 0000 11fb 28c4 0018 000c 5f54 4e1c 0000 0000 068b 52c4 0000 0000 11fb 28c4 0018 000c 5f6c 4e1c 0000
1073320  0000 0693 52c4 0000 0000 11fb 28c4 0018 000c 5f84 4e1c 0000 0000 069b 52c4 0000 0000 11fb 28c4 0018 000c 5f9c 4e1c 0000
1073400  0000 06a3 52c4 0000 0000 11fb 28c4 0018 000c 5fb4 4e1c 0000 0000 06ab 52c4 0000 0000 11fb 28c4 0018 000c 5fcc 4e1c 0000
1073460  0000 06b3 52c4 0000 0000 11fb 28c4 0018 000c 5fe4 4e1c 0000 0000 06bb 52c4 0000 0000 11fb 28c4 0018 000c 5ffc 4e1c 0000
1073540  0000 06c3 52c4 0000 0000 11fb 28c4 0018 000c 6014 4e1c 0000 0000 06cb 52c4 0000 0000 11fb 28c4 0018 000c 602c 4e1c 0000
1073620  0000 06d3 52c4 0000 0000 11fb 28c4 0018 000c 6044 4e1c 0000 0000 06db 52c4 0000 0000 11fb 28c4 0018 000c 605c 4e1c 0000
1073700  0000 06e3 52c4 0000 0000 11fb 28c4 0018 000c 6074 4e1c 0000 0000 06eb 52c4 0000 0000 11fb 28c4 0018 000c 608c 4e1c 0000
1073760  0000 06f3 52c4 0000 0000 11fb 28c4 0018 000c 60a4 4e1c 0000 0000 06fb 52c4 0000 0000 41fb 28c4 0018 000c 60bc 4e1c 0000
1074040  0000 0703 52c4 0000 0000 21fb 28c4 0018 000c 60d4 4e1c 0000 0000 070b 52c4 0000 0000 21fb 28c4 0018 000c 60ec 4e1c 0000
1074120  0000 0713 52c4 0000 0000 21fb 28c4 0018 000c 6104 4e1c 0000 0000 071b 52c4 0000 0000 21fb 28c4 0018 000c 611c 4e1c 0000
1074200  0000 0723 52c4 0000 0000 21fb 28c4 0018 000c 6134 4e1c 0000 0000 072b 52c4 0000 0000 21fb 28c4 0018 000c 614c 4e1c 0000
1074260  0000 0733 52c4 0000 0000 21fb 28c4 0018 000c 6164 4e1c 0000 0000 073b 52c4 0000 0000 21fb 28c4 0018 000c 617c 4e1c 0000
1074340  0000 0743 52c4 0000 0000 21fb 28c4 0018 000c 6194 4e1c 0000 0000 074b 52c4 0000 0000 21fb 28c4 0018 000c 61ac 4e1c 0000
1074420  0000 0753 52c4 0000 0000 21fb 28c4 0018 000c 61c4 4e1c 0000 0000 075b 52c4 0000 0000 21fb 28c4 0018 000c 61dc 4e1c 0000
1074500  0000 0763 52c4 0000 0000 21fb 28c4 0018 000c 61f4 4e1c 0000 0000 076b 52c4 0000 0000 21fb 28c4 0018 000c 620c 4e1c 0000
1074560  0000 0773 52c4 0000 0000 21fb 28c4 0018 000c 6224 4e1c 0000 0000 077b 52c4 0000 0000 21fb 28c4 0018 000c 623c 4e1c 0000
1074640  0000 0783 52c4 0000 0000 21fb 28c4 0018 000c 6254 4e1c 0000 0000 078b 52c4 0000 0000 21fb 28c4 0018 000c 626c 4e1c 0000
1074720  0000 0793 52c4 0000 0000 21fb 28c4 0018 000c 6284 4e1c 0000 0000 079b 52c4 0000 0000 21fb 28c4 0018 000c 629c 4e1c 0000
1075000  0000 07a3 52c4 0000 0000 21fb 28c4 0018 000c 62b4 4e1c 0000 0000 07ab 52c4 0000 0000 21fb 28c4 0018 000c 62cc 4e1c 0000
1075060  0000 07b3 52c4 0000 0000 21fb 28c4 0018 000c 62e4 4e1c 0000 0000 07bb 52c4 0000 0000 21fb 28c4 0018 000c 62fc 4e1c 0000
1075140  0000 07c3 52c4 0000 0000 21fb 28c4 0018 000c 6314 4e1c 0000 0000 07cb 52c4 0000 0000 21fb 28c4 0018 000c 632c 4e1c 0000
1075220  0000 07d3 52c4 0000 0000 21fb 28c4 0018 000c 6344 4e1c 0000 0000 07db 52c4 0000 0000 21fb 28c4 0018 000c 635c 4e1c 0000
1075300  0000 07e3 52c4 0000 0000 21fb 28c4 0018 000c 6374 4e1c 0000 0000 07eb 52c4 0000 0000 21fb 28c4 0018 000c 638c 4e1c 0000
1075360  0000 07f3 52c4 0000 0000 21fb 2954 0018 0002 438a 4e1c 0000 0000 07fb 52c4 0000 0000 41fb 2c78 0010 0002 438a 239c 0000
1075440  000c 41b8 000c 41c8 0100 3e97 0000 3287 0000 0004 000c 63d4 000c 63d4 0041 0000 0000 0000 2c78 0010 0002 438a 239c 0000
1075520  000c 41d8 000c 41e8 0100 3e9f 0000 3287 0000 0004 000c 6404 000c 6404 0041 0000 0000 0000 2c78 0010 0002 438a 239c 0000
1075600  000c 41f8 000c 4208 0100 3ea7 0000 3287 0000 0004 000c 6434 000c 6434 0041 0000 0000 0000 2c78 0010 0002 438a 239c 0000
1075660  000c 4218 000c 4228 0100 3eaf 0000 3287 0000 0004 000c 6464 000c 6464 0041 0000 0000 0000 2c78 0010 0002 438a 239c 0000
1075740  000c 4238 000c 4248 0100 3eb7 0000 3287 0000 0004 000c 6494 000c 6494 0041 0000 0000 0000 2c78 0010 0002 438a 239c 0000
1076020  000c 4258 000c 42a8 0100 3ebf 0000 3287 0000 0004 000c 64c4 000c 64c4 0041 0000 0000 0000 2c78 0010 0002 438a 239c 0000
1076100  000c 4278 000c 64a4 0200 3ebf 0000 3287 0000 0008 000c 64f4 000c 64f4 0041 0000 0000 0000 2c78 0010 0002 438a 239c 0000
1076160  000c 4298 000c 64d4 0300 3ebf 0000 3287 0000 000c 000c 6524 000c 6524 0041 0000 0000 0000 2c78 0010 0002 438a 239c 0000
1076240  000c 42b8 000c 42c8 0100 3ec7 0000 3287 0000 0004 000c 6554 000c 6554 0041 0000 0000 0000 2c78 0010 0002 438a 239c 0000
1076320  000c 42d8 000c 42e8 0100 3ecf 0000 3287 0000 0004 000c 6584 000c 6584 0041 0000 0000 0000 2c78 0010 0002 438a 239c 0000
1076400  000c 42f8 000c 4308 0100 3ed7 0000 3287 0000 0004 000c 65b4 000c 65b4 0041 0000 0000 0000 2c78 0010 0002 438a 239c 0000
1076460  000c 4318 000c 4328 0100 3edf 0000 3287 0000 0004 000c 65e4 000c 65e4 0041 0000 0000 0000 2c78 0010 0002 438a 239c 0000
1076540  000c 4338 000c 4348 0100 3ee7 0000 3287 0000 0004 000c 6614 000c 6614 0041 0000 0000 0000 2c78 0010 0002 438a 239c 0000
1076620  000c 4358 000c 4368 0100 3eef 0000 3287 0000 0004 000c 6644 000c 6644 0041 0000 0000 0000 2c78 0010 0002 438a 239c 0000
1076700  000c 4378 000c 4388 0100 3ef7 0000 3287 0000 0004 000c 6674 000c 6674 0041 0000 0000 0000 2c78 0010 0002 438a 239c 0000
1076760  000c 4398 000c 43a8 0200 3eff 0000 3287 0000 0008 000c 66a4 000c 66a4 0041 0000 0000 0000 2c78 0010 0002 438a 239c 0000
1077040  000c 43b8 000c 43c8 0100 3f07 0000 3287 0000 0004 000c 66d4 000c 66d4 0041 0000 0000 0000 2c78 0010 0002 438a 239c 0000
1077120  000c 43d8 000c 43e8 0100 3f0f 0000 3287 0000 0004 000c 6704 000c 6704 0041 0000 0000 0000 2c78 0010 0002 438a 239c 0000
1077200  000c 43f8 000c 4408 0100 3f17 0000 3287 0000 0004 000c 6734 000c 6734 0041 0000 0000 0000 2c78 0010 0002 438a 239c 0000
1077260  000c 4418 000c 4428 0100 3f1f 0000 3287 0000 0004 000c 6764 000c 6764 0041 0000 0000 0000 2c78 0010 0002 438a 239c 0000
1077340  000c 4438 000c 4448 0100 3f27 0000 3287 0000 0004 000c 6794 000c 6794 0041 0000 0000 0000 2c78 0010 0002 438a 239c 0000
1077420  000c 4458 000c 4468 0100 3f2f 0000 3287 0000 0004 000c 67c4 000c 67c4 0041 0000 0000 0000 2c78 0010 0002 438a 239c 0000
1077500  000c 4478 000c 4488 0100 3f37 0000 3287 0000 0004 000c 67f4 000c 67f4 0041 0000 0000 0000 2c78 0010 0002 438a 239c 0000
1077560  000c 4498 000c 44a8 0200 3f3f 0000 3287 0000 0008 000c 6824 000c 6824 0041 0000 0000 0000 2c78 0010 0002 438a 239c 0000
1077640  000c 44b8 000c 44c8 0200 3f47 0000 3287 0000 0008 000c 6854 000c 6854 0041 0000 0000 0000 2c78 0010 0002 438a 239c 0000
1077720  000c 44d8 0029 2f68 6f6d 652f 6f73 6173 322f 622f 7175 696e 7475 732f 7077 312e 312f 6c69 6272 6172 792f 6c69 7374 7300
1100000  002c 2f68 6f6d 652f 6f73 6173 322f 622f 7175 696e 7475 732f 7077 312e 312f 6c69 6272 6172 792f 6c69 7374 732e 706c 0061
```

| | | | | | | | | | | | | | | | | | | | | | | | | |
|---|---|---|---|---|---|---|---|---|---|---|---|---|---|---|---|---|---|---|---|---|---|---|---|---|
| 1100060 | 0034 | 2f68 | 6f6d | 652f | 6f73 | 6173 | 322f | 622f | 7175 | 696e | 7475 | 732f | 6765 | 6e65 | 7269 | 632f | 7170 | 6c69 | 6232 | 2e35 | 2f6c | 6962 | 7261 | 7279 |
| 1100140 | 2f6c | 6973 | 7473 | 006e | 0037 | 2f68 | 6f6d | 652f | 6f73 | 6173 | 322f | 622f | 7175 | 696e | 7475 | 732f | 6765 | 6e65 | 7269 | 632f | 7170 | 6c69 | 6232 | 2e35 |
| 1100220 | 2f6c | 6962 | 7261 | 7279 | 2f6c | 6973 | 7473 | 2e70 | 6c00 | 7465 | 0028 | 2f68 | 6f6d | 652f | 6f73 | 6173 | 322f | 622f | 7175 | 696e | 7475 | 732f | 7077 | 312e |
| 1100300 | 312f | 6c69 | 6272 | 6172 | 792f | 7365 | 7473 | 0074 | 002b | 2f68 | 6f6d | 652f | 6f73 | 6173 | 322f | 622f | 7175 | 696e | 7475 | 732f | 7077 | 312e | 312f | 6c69 |
| 1100360 | 6272 | 6172 | 792f | 7365 | 7473 | 2e70 | 6c00 | 6e67 | 0033 | 2f68 | 6f6d | 652f | 6f73 | 6173 | 322f | 622f | 7175 | 696e | 7475 | 732f | 6765 | 6e65 | 7269 | 632f |
| 1100440 | 7170 | 6c69 | 6232 | 2e35 | 2f6c | 6962 | 7261 | 7279 | 2f73 | 6574 | 7300 | 7277 | 0036 | 2f68 | 6f6d | 652f | 6f73 | 6173 | 322f | 622f | 7175 | 696e | 7475 | 732f |
| 1100520 | 6765 | 6e65 | 7269 | 632f | 7170 | 6c69 | 6232 | 2e35 | 2f6c | 6962 | 7261 | 7279 | 2f73 | 6574 | 732e | 706c | 0020 | 3a2d | 002b | 2f68 | 6f6d | 652f | 6f73 | 6173 |
| 1100600 | 322f | 622f | 7175 | 696e | 7475 | 732f | 7077 | 312e | 312f | 6c69 | 6272 | 6172 | 792f | 6669 | 6e64 | 616c | 6c00 | 7065 | 002e | 2f68 | 6f6d | 652f | 6f73 | 6173 |
| 1100660 | 322f | 622f | 7175 | 696e | 7475 | 732f | 7077 | 312e | 312f | 6c69 | 6272 | 6172 | 792f | 6669 | 6e64 | 616c | 6c2e | 706c | 005f | 6669 | 0036 | 2f68 | 6f6d | 652f |
| 1100740 | 6f73 | 6173 | 322f | 622f | 7175 | 696e | 7475 | 732f | 6765 | 6e65 | 7269 | 632f | 7170 | 6c69 | 6232 | 2e35 | 2f6c | 6962 | 7261 | 7279 | 2f66 | 696e | 6461 | 6c6c |
| 1101020 | 006c | 292c | 0039 | 2f68 | 6f6d | 652f | 6f73 | 6173 | 322f | 622f | 7175 | 696e | 7475 | 732f | 6765 | 6e65 | 7269 | 632f | 7170 | 6c69 | 6232 | 2e35 | 2f6c | 6962 |
| 1101100 | 7261 | 7279 | 2f66 | 696e | 6461 | 6c6c | 2e70 | 6c00 | 0000 | 002c | 000d | 2418 | b27c | b66c | 0000 | 0305 | 7fff | ffff | 000c | a3e4 | 0200 | 0db5 | 0200 | 2f35 |
| 1101160 | 0000 | 4767 | 0000 | 029b | 0000 | 315f | 0000 | 002c | 000d | 2444 | b27c | b66c | 0000 | 0362 | 7fff | ffff | 000c | ca48 | 0200 | 0db5 | 0200 | 224d | 0000 | 4767 |
| 1101240 | 0000 | 473f | 0000 | 315f | 000e | 6469 | 736a | 6f69 | 6e74 | 5f75 | 6e69 | 6f6e | 0000 | 0000 | 0000 | 002c | 000c | ca7c | b27c | b66c | 0000 | 0363 | 7fff | ffff |
| 1101320 | 000d | 2954 | 0200 | 0db5 | 0200 | 24bd | 0000 | 3287 | 0000 | 473f | 0000 | 315f | 0000 | 002c | 000b | 026c | b27c | b66c | 0000 | 0309 | 7fff | ffff | 000d | 24b0 |
| 1101400 | 0200 | 0db5 | 0200 | 284d | 0000 | 473f | 0000 | 4767 | 0000 | 315f | 0000 | 0034 | 000b | 0300 | b27c | b66c | 0000 | 030a | 7fff | ffff | 000c | 6be0 | 0200 | 0db5 |
| 1101460 | 0400 | 242d | 0000 | 1d17 | 0000 | 0013 | 0000 | 473f | 0000 | 21cf | 0000 | 315f | 0000 | 0034 | 000c | 6bac | b27c | b66c | 0000 | 030b | 7fff | ffff | 000c | 6c14 |
| 1101540 | 0200 | 0db5 | 0400 | 242d | 0000 | 1d17 | 0000 | 002b | 0000 | 473f | 0000 | 21cf | 0000 | 315f | 0000 | 0034 | 000c | 6be0 | b27c | b66c | 0000 | 030c | 7fff | ffff |
| 1101620 | 000c | 6c48 | 0200 | 0db5 | 0400 | 242d | 0000 | 47af | 0000 | 0023 | 0000 | 473f | 0000 | 21cf | 0000 | 315f | 0000 | 0034 | 000c | 6c14 | b27c | b66c | 0000 | 030d |
| 1101700 | 7fff | ffff | 000c | 6c7c | 0200 | 0db5 | 0400 | 242d | 0000 | 47b7 | 0000 | 001b | 0000 | 473f | 0000 | 21cf | 0000 | 315f | 0000 | 0034 | 000c | 6c48 | b27c | b66c |
| 1101760 | 0000 | 030e | 7fff | ffff | 000c | 6cb0 | 0200 | 0db5 | 0400 | 242d | 0000 | 47b7 | 0000 | 0023 | 0000 | 473f | 0000 | 21cf | 0000 | 315f | 0000 | 0034 | 000c | 6c7c |
| 1102040 | b27c | b66c | 0000 | 030f | 7fff | ffff | 000c | 6ce4 | 0200 | 0db5 | 0400 | 242d | 0000 | 47bf | 0000 | 000b | 0000 | 473f | 0000 | 21cf | 0000 | 315f | 0000 | 0034 |
| 1102120 | 000c | 6cb0 | b27c | b66c | 0000 | 0310 | 7fff | ffff | 000c | 6d18 | 0200 | 0db5 | 0400 | 242d | 0000 | 47c7 | 0000 | 001b | 0000 | 473f | 0000 | 21cf | 0000 | 315f |
| 1102200 | 0000 | 0034 | 000c | 6ce4 | b27c | b66c | 0000 | 0311 | 7fff | ffff | 000c | 6d4c | 0200 | 0db5 | 0400 | 242d | 0000 | 47cf | 0000 | 0013 | 0000 | 473f | 0000 | 21cf |
| 1102260 | 0000 | 315f | 0000 | 0034 | 000c | 6d18 | b27c | b66c | 0000 | 0312 | 7fff | ffff | 000c | 6d80 | 0200 | 0db5 | 0400 | 242d | 0000 | 47d7 | 0000 | 001b | 0000 | 473f |
| 1102340 | 0000 | 21cf | 0000 | 315f | 0000 | 0034 | 000c | 6d4c | b27c | b66c | 0000 | 0313 | 7fff | ffff | 000c | 6db4 | 0200 | 0db5 | 0400 | 242d | 0000 | 47df | 0000 | 001b |
| 1102420 | 0000 | 473f | 0000 | 21cf | 0000 | 315f | 0000 | 0034 | 000c | 6d80 | b27c | b66c | 0000 | 0314 | 7fff | ffff | 000c | 6de8 | 0200 | 0db5 | 0400 | 242d | 0000 | 47e7 |
| 1102500 | 0000 | 001b | 0000 | 473f | 0000 | 21cf | 0000 | 315f | 0000 | 0034 | 000c | 6db4 | b27c | b66c | 0000 | 0315 | 7fff | ffff | 000c | 6e1c | 0200 | 0db5 | 0400 | 242d |
| 1102560 | 0000 | 47e7 | 0000 | 0023 | 0000 | 473f | 0000 | 21cf | 0000 | 315f | 0000 | 0034 | 000c | 6de8 | b27c | b66c | 0000 | 0316 | 7fff | ffff | 000c | 6e50 | 0200 | 0db5 |
| 1102640 | 0400 | 242d | 0000 | 47ef | 0000 | 001b | 0000 | 473f | 0000 | 21cf | 0000 | 315f | 0000 | 0034 | 000c | 6e1c | b27c | b66c | 0000 | 0317 | 7fff | ffff | 000c | 6e84 |
| 1102720 | 0200 | 0db5 | 0400 | 242d | 0000 | 47ef | 0000 | 0023 | 0000 | 473f | 0000 | 21cf | 0000 | 315f | 0000 | 0034 | 000c | 6e50 | b27c | b66c | 0000 | 0319 | 7fff | ffff |
| 1103000 | 000c | 6eb8 | 0200 | 0db5 | 0400 | 242d | 0000 | 47f7 | 0000 | 0013 | 0000 | 473f | 0000 | 21cf | 0000 | 315f | 0000 | 0034 | 000c | 6e84 | b27c | b66c | 0000 | 0319 |
| 1103060 | 7fff | ffff | 000c | 6eec | 0200 | 0db5 | 0400 | 242d | 0000 | 2b37 | 0000 | 0013 | 0000 | 473f | 0000 | 21cf | 0000 | 315f | 0000 | 0034 | 000c | 6eb8 | b27c | b66c |
| 1103140 | 0000 | 031a | 7fff | ffff | 000c | 6f20 | 0200 | 0db5 | 0400 | 242d | 0000 | 47ff | 0000 | 0023 | 0000 | 473f | 0000 | 21cf | 0000 | 315f | 0000 | 0034 | 000c | 6eec |
| 1103220 | b27c | b66c | 0000 | 031b | 7fff | ffff | 000c | 6f54 | 0200 | 0db5 | 0400 | 242d | 0000 | 4807 | 0000 | 0013 | 0000 | 473f | 0000 | 21cf | 0000 | 315f | 0000 | 0034 |
| 1103300 | 000c | 6f20 | b27c | b66c | 0000 | 031c | 7fff | ffff | 000c | 6f88 | 0200 | 0db5 | 0400 | 242d | 0000 | 480f | 0000 | 0013 | 0000 | 473f | 0000 | 21cf | 0000 | 315f |
| 1103360 | 0000 | 0034 | 000c | 6f54 | b27c | b66c | 0000 | 031d | 7fff | ffff | 000c | 6fbc | 0200 | 0db5 | 0400 | 242d | 0000 | 4817 | 0000 | 0013 | 0000 | 473f | 0000 | 21cf |
| 1103440 | 0000 | 315f | 0000 | 0034 | 000c | 6f88 | b27c | b66c | 0000 | 031e | 7fff | ffff | 000c | 6ff0 | 0200 | 0db5 | 0400 | 242d | 0000 | 481f | 0000 | 0013 | 0000 | 473f |
| 1103520 | 0000 | 21cf | 0000 | 315f | 0000 | 0034 | 000c | 6fbc | b27c | b66c | 0000 | 031f | 7fff | ffff | 000c | 7024 | 0200 | 0db5 | 0400 | 242d | 0000 | 4827 | 0000 | 0013 |
| 1103600 | 0000 | 473f | 0000 | 21cf | 0000 | 315f | 0000 | 0034 | 000c | 6ff0 | b27c | b66c | 0000 | 0320 | 7fff | ffff | 000c | 7058 | 0200 | 0db5 | 0400 | 242d | 0000 | 482f |
| 1103660 | 0000 | 0013 | 0000 | 473f | 0000 | 21cf | 0000 | 315f | 0000 | 0034 | 000c | 7024 | b27c | b66c | 0000 | 0321 | 7fff | ffff | 000c | 708c | 0200 | 0db5 | 0400 | 242d |
| 1103740 | 0000 | 482f | 0000 | 001b | 0000 | 473f | 0000 | 21cf | 0000 | 315f | 0000 | 0034 | 000c | 7058 | b27c | b66c | 0000 | 0322 | 7fff | ffff | 000c | 70c0 | 0200 | 0db5 |
| 1104020 | 0400 | 242d | 0000 | 4837 | 0000 | 0023 | 0000 | 473f | 0000 | 21cf | 0000 | 315f | 0000 | 0034 | 000c | 708c | b27c | b66c | 0000 | 0323 | 7fff | ffff | 000c | 70f4 |
| 1104100 | 0200 | 0db5 | 0400 | 242d | 0000 | 483f | 0000 | 0023 | 0000 | 473f | 0000 | 21cf | 0000 | 315f | 0000 | 0034 | 000c | 70c0 | b27c | b66c | 0000 | 0324 | 7fff | ffff |
| 1104160 | 000c | 7128 | 0200 | 0db5 | 0400 | 242d | 0000 | 4847 | 0000 | 0013 | 0000 | 473f | 0000 | 21cf | 0000 | 315f | 0000 | 0034 | 000c | 70f4 | b27c | b66c | 0000 | 0325 |
| 1104240 | 7fff | ffff | 000c | 715c | 0200 | 0db5 | 0400 | 242d | 0000 | 484f | 0000 | 001b | 0000 | 473f | 0000 | 21cf | 0000 | 315f | 0000 | 0034 | 000c | 7128 | b27c | b66c |
| 1104320 | 0000 | 0326 | 7fff | ffff | 000c | 7190 | 0200 | 0db5 | 0400 | 242d | 0000 | 4857 | 0000 | 0013 | 0000 | 473f | 0000 | 21cf | 0000 | 315f | 0000 | 0034 | 000c | 715c |
| 1104400 | b27c | b66c | 0000 | 0327 | 7fff | ffff | 000c | 71c4 | 0200 | 0db5 | 0400 | 242d | 0000 | 485f | 0000 | 0013 | 0000 | 473f | 0000 | 21cf | 0000 | 315f | 0000 | 0034 |
| 1104460 | 000c | 7190 | b27c | b66c | 0000 | 0328 | 7fff | ffff | 000c | 71f8 | 0200 | 0db5 | 0400 | 242d | 0000 | 4867 | 0000 | 0013 | 0000 | 473f | 0000 | 21cf | 0000 | 315f |
| 1104540 | 0000 | 0034 | 000c | 71c4 | b27c | b66c | 0000 | 0329 | 7fff | ffff | 000d | 24dc | 0200 | 0db5 | 0400 | 242d | 0000 | 486f | 0000 | 0013 | 0000 | 473f | 0000 | 21cf |
| 1104620 | 0000 | 315f | 0000 | 0034 | 000c | 8f94 | b27c | b66c | 0000 | 032a | 7fff | ffff | 000c | 7260 | 0200 | 0db5 | 0400 | 24ad | 0000 | 1d17 | 0000 | 001b | 0000 | 473f |
| 1104700 | 0000 | 3a8f | 0000 | 315f | 0000 | 0034 | 000c | 722c | b27c | b66c | 0000 | 032c | 7fff | ffff | 000d | f8c8 | 0200 | 0db5 | 0400 | 24ad | 0000 | 2ecf | 0000 | 0023 |
| 1104760 | 0000 | 473f | 0000 | 31c7 | 0000 | 315f | 000c | 7a1c | 0000 | 06f8 | b288 | b66c | 0000 | 032b | 7fff | ffff | 000c | 7260 | 0200 | 0db5 | 0100 | 15ad | 0100 | 33fd |
| 1105040 | 0200 | 0b3d | 0000 | 1f77 | 0000 | 000b | 0000 | 315f | 000c | 72f8 | 0000 | 0034 | b288 | b66c | 0000 | 032b | 7fff | ffff | 000c | 7294 | 0200 | 0db5 | 0100 | 15ad |
| 1105120 | 0100 | 33fd | 0200 | 0b3d | 0000 | 1fd7 | 0000 | 000b | 0000 | 315f | 000c | 732c | 0000 | 0034 | b288 | b66c | 0000 | 032b | 7fff | ffff | 000c | 72c8 | 0200 | 0db5 |

```
1105200 0100 15ad 0100 33fd 0200 0b3d 0000 1ff7 0000 000b 0000 315f 000c 7360 0000 0034 b288 b66c 0000 032b 7fff ffff 000c 72fc
1105260 0200 0db5 0100 15ad 0100 33fd 0200 0b3d 0000 240f 0000 000b 0000 315f 000c 7394 0000 0034 b288 b66c 0000 032b 7fff ffff
1105340 000c 7330 0200 0db5 0100 15ad 0100 33fd 0200 0b3d 0000 2c1f 0000 000b 0000 315f 000c 73c8 0000 0034 b288 b66c 0000 032b
1105420 7fff ffff 000c 7364 0200 0db5 0100 15ad 0100 33fd 0200 0b3d 0000 2edf 0000 000b 0000 315f 000c 73fc 0000 0034 b288 b66c
1105500 0000 032b 7fff ffff 000c 7398 0200 0db5 0100 15ad 0100 33fd 0200 0b3d 0000 301f 0000 000b 0000 315f 000c 7430 0000 0034
1105560 b288 b66c 0000 032b 7fff ffff 000c 73cc 0200 0db5 0100 15ad 0100 33fd 0200 0b3d 0000 309f 0000 0013 0000 315f 000c 7464
1105640 0000 0034 b288 b66c 0000 032b 7fff ffff 000c 7400 0200 0db5 0100 15ad 0100 33fd 0200 0b3d 0000 28a7 0000 001b 0000 315f
1105720 000c 7498 0000 0034 b288 b66c 0000 032b 7fff ffff 000c 7434 0200 0db5 0100 15ad 0100 33fd 0200 0b3d 0000 28a7 0000 0023
1106000 0000 315f 000c 74cc 0000 0034 b288 b66c 0000 032b 7fff ffff 000c 7468 0200 0db5 0100 15ad 0100 33fd 0200 0b3d 0000 2ecf
1106060 0000 001b 0000 315f 000c 7500 0000 0034 b288 b66c 0000 032b 7fff ffff 000c 749c 0200 0db5 0100 15ad 0100 33fd 0200 0b3d
1106140 0000 2ecf 0000 0023 0000 315f 000c 7534 0000 0034 b288 b66c 0000 032b 7fff ffff 000c 74d0 0200 0db5 0100 15ad 0100 33fd
1106220 0200 0b3d 0000 28af 0000 001b 0000 315f 000c 7568 0000 0034 b288 b66c 0000 032b 7fff ffff 000c 7504 0200 0db5 0100 15ad
1106300 0100 33fd 0200 0b3d 0000 28b7 0000 002b 0000 315f 000c 759c 0000 0034 b288 b66c 0000 032b 7fff ffff 000c 7538 0200 0db5
1106360 0100 15ad 0100 33fd 0200 0b3d 0000 28bf 0000 001b 0000 315f 000c 75d0 0000 0034 b288 b66c 0000 032b 7fff ffff 000c 756c
1106440 0200 0db5 0100 15ad 0100 33fd 0200 0b3d 0000 28c7 0000 001b 0000 315f 000c 7604 0000 0034 b288 b66c 0000 032b 7fff ffff
1106520 000c 75a0 0200 0db5 0100 15ad 0100 33fd 0200 0b3d 0000 28cf 0000 001b 0000 315f 000c 7638 0000 0034 b288 b66c 0000 032b
1106600 7fff ffff 000c 75d4 0200 0db5 0100 15ad 0100 33fd 0200 0b3d 0000 28d7 0000 001b 0000 315f 000c 766c 0000 0034 b288 b66c
1106660 0000 032b 7fff ffff 000c 7608 0200 0db5 0100 15ad 0100 33fd 0200 0b3d 0000 28df 0000 001b 0000 315f 000c 76a0 0000 0034
1106740 b288 b66c 0000 032b 7fff ffff 000c 763c 0200 0db5 0100 15ad 0100 33fd 0200 0b3d 0000 28e7 0000 001b 0000 315f 000c 76d4
1107020 0000 0034 b288 b66c 0000 032b 7fff ffff 000c 7670 0200 0db5 0100 15ad 0100 33fd 0200 0b3d 0000 28ef 0000 001b 0000 315f
1107100 000c 7708 0000 0034 b288 b66c 0000 032b 7fff ffff 000c 76a4 0200 0db5 0100 15ad 0100 33fd 0200 0b3d 0000 28f7 0000 001b
1107160 0000 315f 000c 773c 0000 0034 b288 b66c 0000 032b 7fff ffff 000c 76d8 0200 0db5 0100 15ad 0100 33fd 0200 0b3d 0000 28ff
1107240 0000 001b 0000 315f 000c 7770 0000 0034 b288 b66c 0000 032b 7fff ffff 000c 770c 0200 0db5 0100 15ad 0100 33fd 0200 0b3d
1107320 0000 2907 0000 0023 0000 315f 000c 77a4 0000 0034 b288 b66c 0000 032b 7fff ffff 000c 7740 0200 0db5 0100 15ad 0100 33fd
1107400 0200 0b3d 0000 290f 0000 001b 0000 315f 000c 77d8 0000 0034 b288 b66c 0000 032b 7fff ffff 000c 7774 0200 0db5 0100 15ad
1107460 0100 33fd 0200 0b3d 0000 2917 0000 001b 0000 315f 000c 780c 0000 0034 b288 b66c 0000 032b 7fff ffff 000c 77a8 0200 0db5
1107540 0100 15ad 0100 33fd 0200 0b3d 0000 291f 0000 001b 0000 315f 000c 7844 0000 0038 b27c b66c 0000 032d 0000 0364 000c 7874
1107620 0200 0db5 0500 1cdd 0000 2def 0000 000b 0000 473f 006b 4e23 0000 029b 0000 315f 000c 7870 0000 002c b4f0 b4e4 0000 032c
1107700 7fff ffff 0008 b0dd 0000 0000 0000 0000 000c a104 0002 438a 000d 8488 000c 78a8 0000 0038 b27c b66c 0000 032f 0000 0365
1107760 000c 78ac 0200 0db5 0500 1cdd 0000 1d17 0000 0013 0000 473f 006a 2143 0000 029b 0000 315f 000c 78e0 0000 0038 b27c b66c
1110040 0000 0330 0000 0366 000c 78e4 0200 0db5 0500 1cdd 0000 1d17 0000 002b 0000 473f 006a 2243 0000 029b 0000 315f 000c 7918
1110120 0000 0038 b27c b66c 0000 0331 0000 0367 000c 791c 0200 0db5 0500 1cdd 0000 47af 0000 0023 0000 473f 006a 2343 0000 029b
1110200 0000 315f 000c 7950 0000 0038 b27c b66c 0000 0332 0000 0368 000c 7954 0200 0db5 0500 1cdd 0000 47b7 0000 001b 0000 473f
1110260 006a 2443 0000 029b 0000 315f 000c 7a1c 0000 0038 b27c b66c 0000 0333 0000 0369 000c 7a20 0200 0db5 0500 1cdd 0000 47b7
1110340 0000 0023 0000 473f 006a 2543 0000 029b 0000 315f 2c78 0094 0002 438a 45dc 46d8 4768 47bc 9328 9afc 0034 9300 9460 002e
1110420 aa50 aab4 0000 a4bc 0010 38c0 386c 37dc 37b0 234c 000d 6c9c aa50 aab4 0000 a1d0 000a 37b0 4a7c 0010 723c c5a8 44e8 0000
1110500 0400 47b7 6dd8 6d0c 6d94 6d50 4268 0000 0000 001b 3804 42ac 0000 253f 0008 e23c 001c 442c 0400 47b7 6dd8 6d0c 6d94 6d50
1110560 4268 0000 0000 0013 37dc 41d4 0000 2a07 242c 0000 0008 e23c 000c 7a90 0000 0038 b27c b66c 0000 0334 0000 036a 000c 7a94
1110640 0200 0db5 0500 1cdd 0000 487f 0000 0023 0000 473f 006b 64e3 0000 029b 0000 315f 28c4 003c 000d 6d30 56f8 671c 6840 48f8
1110720 47a8 3050 a890 aaf0 ffff ac90 a890 aab4 0000 a4bc 0010 38ac 35c8 3788 242c 0000 000d 6c9c 3788 4a7c 000c 723c 000c 7b2c
1111000 0000 0070 b27c b66c 0000 0335 0000 036b 000c 7acc 0200 0db5 0500 1cdd 0000 47bf 0000 000b 0000 473f 006a 2643 0000 029b
1111060 0000 315f 000c 7b2c 0000 0038 b27c b66c 0000 0336 0000 036c 000c 7b30 0200 0db5 0500 1cdd 0000 47c7 0000 001b 0000 473f
1111140 006a 2743 0000 029b 0000 315f 2954 002c 0002 438a 56f8 6420 5e54 0000 0200 0ad7 6670 0018 5758 6c84 0018 6750 57b8 6c34
1111220 6784 22bc 000d 44e8 000c 7bdc 0000 0038 b27c b66c 0000 0337 0000 036d 000c 7b68 0200 0db5 0500 1cdd 0000 47cf 0000 0013
1111300 0000 473f 006a 2843 0000 029b 0000 315f 000c 7b9c 0000 0038 b27c b66c 0000 0338 0000 036e 000c 7be0 0200 0db5 0500 1cdd
1111360 0000 488f 0000 001b 0000 473f 006b 7383 0000 029b 0000 315f 000c 7bdc 0000 0038 b27c b66c 0000 0345 0000 037b 000c 818c
1111440 0200 0db5 0500 1cdd 0000 4897 0000 001b 0000 473f 006b 8de3 0000 029b 0000 315f 000d 7421 0000 0000 000c 7cec 0000 00a8
1111520 b27c b66c 0000 0339 0000 036f 000c 7c18 0200 0db5 0500 1cdd 0000 47d7 0000 001b 0000 473f 006a 2943 0000 029b 0000 315f
1111600 000c 7c4c 0000 0038 b27c b66c 0000 033a 0000 0370 000c 7c50 0200 0db5 0500 1cdd 0000 47df 0000 001b 0000 473f 006a 2a43
1111660 0000 029b 0000 315f 000c 7cec 0000 0038 b27c b66c 0000 033b 0000 0371 000c 7cf0 0200 0db5 0500 1cdd 0000 47e7 0000 001b
1111740 0000 473f 006a 2b43 0000 029b 0000 315f 2c78 0068 0002 438a 45b8 4700 4754 9300 9afc 0016 aa18 aab4 0000 a3ec 3858 3804
1112020 2420 0000 000d 6ccc 9300 93a8 0018 38ac 4268 0000 0000 0003 37f0 379c 242c 0000 000d 6f5c 44e8 0000 0300 47e7 6d0c 6d94
1112100 6d50 41fc 0000 000b 37dc 41d4 0000 253f 242c 0000 0008 e23c 000c 7d90 0000 0070 b27c b66c 0000 033c 0000 0372 000c 7d28
1112160 0200 0db5 0500 1cdd 0000 48af 0000 0023 0000 473f 006b 7ae3 0000 029b 0000 315f 000c 7d90 0000 0038 b27c b66c 0000 033d
1112240 0000 0373 000c 7d94 0200 0db5 0500 1cdd 0000 48a7 0000 001b 0000 473f 006b 6663 0000 029b 0000 315f 2c78 0034 0002 438a
```

| | | | | | | | | | | | | | | | | | | | | | | | |
|---|---|---|---|---|---|---|---|---|---|---|---|---|---|---|---|---|---|---|---|---|---|---|---|
| 1112320 | 45d0 | 5758 | 671c | 69b0 | 4754 | aa50 | aab4 | 0000 | a1d0 | 0008 | 4a7c | 0010 | 723c | aa50 | aaf0 | ffff | ac08 | 3858 | 37dc | 234c | 000d | 6ccc | 000c | 7e38 |
| 1112400 | 0000 | 0038 | b27c | b66c | 0000 | 033e | 0000 | 0374 | 000c | 7e3c | 0200 | 0db5 | 0500 | 1cdd | 0000 | 47ef | 0000 | 001b | 0000 | 473f | 006a | 2dc3 | 0000 | 029b |
| 1112460 | 0000 | 315f | 2c78 | 0070 | 0002 | 438a | 45b8 | 4700 | 4754 | 9300 | 9afc | 001e | aa18 | aab4 | 0001 | a3ec | aa18 | aaf0 | ffff | ac08 | 3858 | 3804 | 242c | 0000 |
| 1112540 | 000d | 6ccc | 9300 | 93a8 | 0018 | 38ac | 4268 | 0000 | 0000 | 000b | 37f0 | 379c | 242c | 0000 | 000d | 6f5c | 44e8 | 0000 | 0300 | 47ef | 6d0c | 6d94 | 6d50 | 41fc |
| 1112620 | 0000 | 003b | 37dc | 41d4 | 0000 | 253f | 242c | 0000 | 0008 | e23c | 000c | 7ef0 | 0000 | 0038 | b27c | b66c | 0000 | 033f | 0000 | 0375 | 000c | 7ef4 | 0200 | 0db5 |
| 1112700 | 0500 | 1cdd | 0000 | 47e7 | 0000 | 0023 | 0000 | 473f | 006a | 2cc3 | 0000 | 029b | 0000 | 315f | 2c78 | 0080 | 0002 | 438a | 45b8 | 4714 | 4768 | 47bc | 9300 | 9afc |
| 1112760 | 0018 | aa18 | aab4 | 0000 | a3ec | 38c0 | 386c | 3818 | 2420 | 0000 | 000d | 703c | 9300 | 93a8 | 0028 | 37f0 | 3c48 | 0000 | 000d | 4608 | 001c | 3930 | 0018 | 38ac |
| 1113040 | 4268 | 0000 | 0000 | 0003 | 3804 | 37b0 | 242c | 0000 | 000d | 705c | 44e8 | 0000 | 0400 | 47e7 | 6d0c | 6dd8 | 6d94 | 6d50 | 4268 | 0000 | 0000 | 000b | 37dc | 41d4 |
| 1113120 | 0000 | 253f | 242c | 0000 | 0008 | e23c | 000c | 7f74 | 0000 | 0038 | b27c | b66c | 0000 | 0340 | 0000 | 0376 | 000c | 7f78 | 0200 | 0db5 | 0500 | 1cdd | 0000 | 48a7 |
| 1113200 | 0000 | 0023 | 0000 | 473f | 006b | 81e3 | 0000 | 029b | 0000 | 315f | 2c78 | 004c | 0002 | 438a | 45e8 | 001c | 5758 | 6a50 | 69b0 | 4754 | 47e4 | aa88 | 001c | aab4 |
| 1113260 | 0000 | a1d0 | 0010 | 379c | 4a7c | 0010 | 3774 | 4a7c | 0018 | 723c | aa88 | 001c | aaf0 | ffff | ac08 | 3818 | 5758 | 6dc4 | 67b8 | 3858 | 37dc | 234c | 000d | 703c |
| 1113340 | 000c | 7fd8 | 0000 | 0038 | b27c | b66c | 0000 | 0341 | 0000 | 0377 | 000c | 7fdc | 0200 | 0db5 | 0500 | 1cdd | 0000 | 48af | 0000 | 002b | 0000 | 473f | 006b | 82e3 |
| 1113420 | 0000 | 029b | 0000 | 315f | 2954 | 002c | 0002 | 438a | 56f8 | 6580 | 001c | 5878 | 0018 | 6c94 | 001c | 67ec | 0018 | bfcc | a890 | aaf0 | 0001 | ac90 | 239c | 0000 |
| 1113500 | 000d | 705c | 000c | 8298 | 0000 | 0038 | b27c | b66c | 0000 | 0342 | 0000 | 0378 | 000c | 809c | 0200 | 0db5 | 0500 | 1cdd | 0000 | 47ef | 0000 | 0023 | 0000 | 473f |
| 1113560 | 006a | 2f43 | 0000 | 029b | 0000 | 315f | 2c78 | 0088 | 0002 | 438a | 45b8 | 4714 | 4768 | 47bc | 9300 | 9afc | 0020 | aa18 | aab4 | 0001 | a3ec | aa18 | aaf0 | ffff |
| 1113640 | ac08 | 38c0 | 386c | 3818 | 242c | 0000 | 000d | 703c | 9300 | 93a8 | 0028 | 37f0 | 3c48 | 0000 | 000d | 4608 | 001c | 3930 | 0018 | 38ac | 4268 | 0000 | 0000 | 000b |
| 1113720 | 3804 | 37b0 | 242c | 0000 | 000d | 705c | 44e8 | 0000 | 0400 | 47ef | 6d0c | 6dd8 | 6d94 | 6150 | 4268 | 0000 | 0000 | 000b | 37dc | 41d4 | 0000 | 253f | 242c | 0000 |
| 1114000 | 0008 | e23c | 000c | 8188 | 0000 | 00e0 | b27c | b66c | 0000 | 0343 | 0000 | 0379 | 000c | 80d4 | 0200 | 0db5 | 0500 | 1cdd | 0000 | 47f7 | 0000 | 0013 | 0000 | 473f |
| 1114060 | 006a | 3043 | 0000 | 029b | 0000 | 315f | 000c | 8108 | 0000 | 0038 | b27c | b66c | 0000 | 0344 | 0000 | 037a | 000c | 7ba0 | 0200 | 0db5 | 0500 | 1cdd | 0000 | 2b37 |
| 1114140 | 0000 | 0013 | 0000 | 473f | 006a | 31c3 | 0000 | 029b | 0000 | 315f | 000c | 8140 | 0000 | 0038 | b27c | b66c | 0000 | 035b | 0000 | 0391 | 000c | 8144 | 0200 | 0db5 |
| 1114220 | 0500 | 1cdd | 0000 | 4867 | 0000 | 001b | 0000 | 473f | 006b | ce83 | 0000 | 029b | 0000 | 315f | 000c | 8188 | 0000 | 0038 | b27c | b66c | 0000 | 035c | 0000 | 0392 |
| 1114300 | 000c | 8838 | 0200 | 0db5 | 0500 | 1cdd | 0000 | 486f | 0000 | 0013 | 0000 | 473f | 006a | 4ac3 | 0000 | 029b | 0000 | 315f | 000b | 6465 | 6c5f | 656c | 656d | 656e |
| 1114360 | 7400 | 0000 | 000c | 8228 | 0000 | 0070 | b27c | b66c | 0000 | 0346 | 0000 | 037c | 000c | 81c4 | 0200 | 0db5 | 0500 | 1cdd | 0000 | 4807 | 0000 | 0013 | 0000 | 473f |
| 1114440 | 006a | 34c3 | 0000 | 029b | 0000 | 315f | 000c | 8228 | 0000 | 0038 | b27c | b66c | 0000 | 0347 | 0000 | 037d | 000c | 822c | 0200 | 0db5 | 0500 | 1cdd | 0000 | 4807 |
| 1114520 | 0000 | 001b | 0000 | 473f | 006b | 92c3 | 0000 | 029b | 0000 | 315f | 2954 | 0030 | 0002 | 438a | 56f8 | 6840 | 671c | 4700 | 57b8 | 5fa0 | 6784 | 3310 | 24d0 | 0000 |
| 1114600 | 000d | 7258 | 0018 | 386c | 37f0 | 3cf4 | 242c | 0000 | 000d | 71bc | 000c | 92fc | 0000 | 00a8 | b27c | b66c | 0000 | 0348 | 0000 | 037e | 000c | 8264 | 0200 | 0db5 |
| 1114660 | 0500 | 1cdd | 0000 | 47ff | 0000 | 0023 | 0000 | 473f | 006a | 3343 | 0000 | 029b | 0000 | 315f | 000c | 8298 | 0000 | 0038 | b27c | b66c | 0000 | 0349 | 0000 | 037f |
| 1114740 | 000c | 829c | 0200 | 0db5 | 0500 | 1cdd | 0000 | 480f | 0000 | 0013 | 0000 | 473f | 006a | 3643 | 0000 | 029b | 0000 | 315f | 000c | 82fc | 0000 | 0038 | b27c | b66c |
| 1115020 | 0000 | 034a | 0000 | 0380 | 000c | 8300 | 0200 | 0db5 | 0500 | 1cdd | 0000 | 480f | 0000 | 001b | 0000 | 473f | 006b | 98e3 | 0000 | 029b | 0000 | 315f | 28c4 | 002c |
| 1115100 | 000d | 7374 | 56f8 | 5fa0 | 55f0 | 5fa0 | 55f0 | 5fa0 | 55f0 | 5fa0 | 671c | 3050 | a874 | aaf0 | 0004 | ac4c | 239c | 0000 | 000d | 731c | 000c | 8500 | 0000 | 0188 |
| 1115160 | b27c | b66c | 0000 | 034b | 0000 | 0381 | 000c | 8338 | 0200 | 0db5 | 0500 | 1cdd | 0000 | 4817 | 0000 | 0013 | 0000 | 473f | 006a | 37c3 | 0000 | 029b | 0000 | 315f |
| 1115240 | 000c | 836c | 0000 | 0038 | b27c | b66c | 0000 | 034c | 0000 | 0382 | 000c | 8370 | 0200 | 0db5 | 0500 | 1cdd | 0000 | 4827 | 0000 | 0013 | 0000 | 473f | 006a | 3b43 |
| 1115320 | 0000 | 029b | 0000 | 315f | 000c | 83a4 | 0000 | 0038 | b27c | b66c | 0000 | 034d | 0000 | 0383 | 000c | 83a8 | 0200 | 0db5 | 0500 | 1cdd | 0000 | 4827 | 0000 | 0023 |
| 1115400 | 0000 | 473f | 006b | a463 | 0000 | 029b | 0000 | 315f | 000c | 83dc | 0000 | 0038 | b27c | b66c | 0000 | 034e | 0000 | 0384 | 000c | 83e0 | 0200 | 0db5 | 0500 | 1cdd |
| 1115460 | 0000 | 481f | 0000 | 0013 | 0000 | 473f | 006a | 39c3 | 0000 | 029b | 0000 | 315f | 000c | 8414 | 0000 | 0038 | b27c | b66c | 0000 | 034f | 0000 | 0385 | 000c | 8418 |
| 1115540 | 0200 | 0db5 | 0500 | 1cdd | 0000 | 481f | 0000 | 001b | 0000 | 473f | 006b | aa03 | 0000 | 029b | 0000 | 315f | 000c | 844c | 0000 | 0038 | b27c | b66c | 0000 | 0350 |
| 1115620 | 0000 | 0386 | 000c | 8450 | 0200 | 0db5 | 0500 | 1cdd | 0000 | 492f | 0000 | 0013 | 0000 | 473f | 006a | 3d43 | 0000 | 029b | 0000 | 315f | 000c | 8500 | 0000 | 0038 |
| 1115700 | b27c | b66c | 0000 | 0351 | 0000 | 0387 | 000c | 8504 | 0200 | 0db5 | 0500 | 1cdd | 0000 | 482f | 0000 | 001b | 0000 | 473f | 006a | 3ec3 | 0000 | 029b | 0000 | 315f |
| 1115760 | 2c78 | 007c | 0002 | 438a | 45b8 | 46ec | 4768 | 9328 | 9afc | 0016 | aa50 | aab4 | 0000 | a3ec | 3858 | 37dc | 379c | 234c | 000d | 763c | 9328 | 9460 | 0024 | 442c |
| 1116040 | 0300 | 482f | 6d0c | 6d50 | 6d94 | 41fc | 0000 | 001b | 3804 | 41d4 | 0000 | 253f | 242c | 0000 | 0008 | e23c | 9300 | 93a8 | 0018 | 38d4 | 4268 | 0000 | 0000 | 0003 |
| 1116120 | 37dc | 3788 | 242c | 0000 | 000d | 765c | 38d4 | 41fc | 0000 | 0003 | 2410 | 0000 | 000d | 765c | 000c | 8834 | 0000 | 02f8 | b27c | b66c | 0000 | 0352 | 0000 | 0388 |
| 1116200 | 000c | 853c | 0200 | 0db5 | 0500 | 1cdd | 0000 | 489f | 0000 | 001b | 0000 | 473f | 006b | b1e3 | 0000 | 029b | 0000 | 315f | 000c | 8570 | 0000 | 0038 | b27c | b66c |
| 1116260 | 0000 | 0353 | 0000 | 0389 | 000c | 8574 | 0200 | 0db5 | 0500 | 1cdd | 0000 | 489f | 0000 | 0023 | 0000 | 473f | 006b | b2e3 | 0000 | 029b | 0000 | 315f | 000c | 85a8 |
| 1116340 | 0000 | 0038 | b27c | b66c | 0000 | 0354 | 0000 | 038a | 000c | 85ac | 0200 | 0db5 | 0500 | 1cdd | 0000 | 4837 | 0000 | 0023 | 0000 | 473f | 006a | 3fc3 | 0000 | 029b |
| 1116420 | 0000 | 315f | 000c | 85e0 | 0000 | 0038 | b27c | b66c | 0000 | 0355 | 0000 | 038b | 000c | 85e4 | 0200 | 0db5 | 0500 | 1cdd | 0000 | 483f | 0000 | 0023 | 0000 | 473f |
| 1116500 | 006a | 4143 | 0000 | 029b | 0000 | 315f | 000c | 8618 | 0000 | 0038 | b27c | b66c | 0000 | 0356 | 0000 | 038c | 000c | 861c | 0200 | 0db5 | 0500 | 1cdd | 0000 | 4847 |
| 1116560 | 0000 | 0013 | 0000 | 473f | 006a | 4343 | 0000 | 029b | 0000 | 315f | 000c | 8650 | 0000 | 0038 | b27c | b66c | 0000 | 0357 | 0000 | 038d | 000c | 8654 | 0200 | 0db5 |
| 1116640 | 0500 | 1cdd | 0000 | 484f | 0000 | 001b | 0000 | 473f | 006a | 44c3 | 0000 | 029b | 0000 | 315f | 000c | 8688 | 0000 | 0038 | b27c | b66c | 0000 | 0358 | 0000 | 038e |
| 1116720 | 000c | 868c | 0200 | 0db5 | 0500 | 1cdd | 0000 | 4857 | 0000 | 0013 | 0000 | 473f | 006a | 4643 | 0000 | 029b | 0000 | 315f | 000c | 86c0 | 0000 | 0038 | b27c | b66c |
| 1117000 | 0000 | 0359 | 0000 | 038f | 000c | 86c4 | 0200 | 0db5 | 0500 | 1cdd | 0000 | 485f | 0000 | 0013 | 0000 | 473f | 006a | 47c3 | 0000 | 029b | 0000 | 315f | 000c | 86f8 |
| 1117060 | 0000 | 0038 | b27c | b66c | 0000 | 035a | 0000 | 0390 | 000c | 810c | 0200 | 0db5 | 0500 | 1cdd | 0000 | 4867 | 0000 | 0013 | 0000 | 473f | 006a | 4943 | 0000 | 029b |
| 1117140 | 0000 | 315f | 000c | 8738 | 0000 | 0040 | 0000 | 0000 | 0000 | 0000 | 0000 | 0000 | 0000 | 0000 | 000d | 7b28 | 000d | 77ac | 000d | 77f0 | 000d | 785c | 000d | 78f0 |
| 1117220 | 000d | 791c | 000d | 7998 | 000c | 0174 | 0000 | 0000 | 0000 | 0000 | 000c | 8834 | 0000 | 00c0 | 000d | 71cc | 000d | 766c | 000d | 6ff0 | 000d | 6f6c | 000d | 7b28 |
| 1117300 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 |
| 1117360 | 0000 | 0000 | 0000 | 0000 | 0000 | 0000 | 000d | 7138 | 0000 | 0000 | 0000 | 0000 | 0000 | 0000 | 0000 | 0000 | 0000 | 0000 | 0000 | 0000 | 0000 | 0000 | 0000 | 0000 |

```
1117440  0000 0000 0000 0000 0000 0000 0000 0000 0000 0000 0000 0000 0000 0000 000d 6bb4 000d 6b68 000d 6dec 000d 6e38 000d 6ee0
1117520  000d 6f18 000d 6f3c 000d 7000 000d 70ec 000d 72b4 2c78 003c 0002 438a 45c4 46d8 3788 56f8 671c 5fa0 37dc 247c 000d 47a8
1117600  0014 3774 56f8 671c 5fa0 37f0 24d0 0000 000d 47a8 0014 3858 2410 0000 000d 7a54 000c 8fc4 0000 0038 b27c b66c 0000 035d
1117660  0000 0393 000c a178 0200 0db5 0500 1cdd 0000 486f 0000 001b 0000 473f 006b d2a3 0000 029b 0000 315f 000d 7a8c 000b aee8
1117740  0100 3f77 0000 3e17 0000 0004 000c 89e0 000c 89e0 0001 004f 0000 0000 ffff ffff 0200 3f7f 0000 3e17 0000 0008 000c 2510
1120020  000c 2510 0001 004f 0000 0000 000c 886c 0200 3f77 0000 3e17 0000 0008 000c 8a28 000c 8a28 0001 004f 0000 0000 000c 888c
1120100  0300 3f7f 0000 3e17 0000 000c 000c 2574 000c 2574 0001 004f 0000 0000 000c 16fc 0100 3f87 0000 3e17 0000 0004 000c 8ad4
1120160  000c 8ad4 0001 004f 0000 0000 0008 e3ec 0100 3f8f 0000 3e17 0000 0004 000c 8a80 000c 8a80 0001 004f 0000 0000 ffff ffff
1120240  0000 3f97 0000 3e17 0000 0000 000c 266c 000c 266c 0001 004f 0000 0000 0020 2240 2823 2938 392f 3038 2f32 3920 6c69 6e65
1120320  696f 2e70 6c20 2020 2033 332e 3122 0032 000c 4508 0100 2def 0000 3e17 0000 0004 000c 89b8 000c 89b8 0001 004f 0000 0000
1120400  0000 0028 000c 4530 b27c b66c 0000 0275 7fff ffff 000c 8b20 0200 0db5 0100 32b5 0000 3e17 0000 315f 2cac 030b 0002 438a
1120460  2ca0 039b 0000 0000 0000 0f01 000a f7e0 000a f7e0 0002 438a 000c 89dc 000a f7ec 2c78 0026 0002 438a 45b8 3348 329c 247c
1120540  000c 8a18 0018 aa50 aab4 0000 a3ec 3d00 4a7c 000c 723c 8a0a 000c 1dac 0200 3f9f 0000 3e17 0000 0008 000c 2484 000c 2484
1120620  0001 004f 0000 0000 2c78 001e 0002 438a 45b8 329c 24d0 0000 000c 8a18 0014 3d00 4a7c 000c 723c 8a4a 0008 e42c 0200 3fb7
1120700  0000 3e1f 0000 0008 000c ec88 000c ec88 0001 0050 0000 0000 27f0 0018 000c 8aa4 4e1c 0000 0000 0007 239c 0000 0008 d13c
1120760  2cac 0313 0002 438a 2ca0 017b 0000 0000 0000 0001 000c 8a68 000c 8aa4 000c 8aae 000c 486c 2954 001c 0002 438a 56f8 671c
1121040  682c 247c 0008 d83c 0010 2340 000c 891c 27f0 0012 000c 8afc 4e1c 0000 0000 0007 228c 37d7 2cac 0007 0002 438a 2ca0 8ae2
1121120  0000 0000 0000 0001 000c 8ac0 000c 8afc 000c 8b06 000c 8af8 000c 8acc 2954 001c 0002 438a 56f8 671c 682c 247c 0008 d83c
1121200  0010 2340 000c 89fc 0000 0028 000c 8998 b27c b66c 0000 02ac 7fff ffff 000c e9b4 0200 0db5 0100 32b5 0000 400f 0000 315f
1121260  000e 48b8 000c 88ac 0100 3f77 0000 3287 0000 0004 000c 0220 000c 0220 0041 0000 0000 0000 000c 88cc 0200 3f7f 0000 3287
1121340  0000 0008 000c 0744 000c 0744 0041 0000 0000 0000 000c 8b44 0200 3f77 0000 3287 0000 0008 000c 0754 000c 0754 0041 0000
1121420  0000 0000 000c 8b64 0300 3f7f 0000 3287 0000 000c 000c 079c 000c 079c 0041 0000 0000 0000 000c 88ec 0100 3f87 0000 3287
1121500  0000 0004 000c 07d4 000c 07d4 0041 0000 0000 0000 000c 890c 0100 3f8f 0000 3287 0000 0004 000c 0820 000c 0820 0041 0000
1121560  0000 0000 000c 892c 0000 3f97 0000 3287 0000 0000 000c 0904 000c 0904 0041 0000 0000 0000 0010 6469 7265 6374 6f72 795f
1121640  6578 6973 7473 00ff 000f 6669 6c65 5f6d 7573 745f 6578 6973 7400 315f 000c 8a48 0300 3fb7 0000 3e1f 0000 000c 000c 9d88
1121720  000c 9d88 0001 0050 0000 0000 0008 e46c 0000 3fbf 0000 3e1f 0000 0000 000c a0d0 000c a0d0 0001 0050 0000 0000 0008 b9ac
1122000  0200 3fc7 0000 3e1f 0000 0008 000c 9868 000c 99c0 0001 0050 0000 0000 ffff ffff 0100 3fcf 0000 3e1f 0000 0004 000c 9630
1122060  000c 9630 0001 0050 0000 0000 0008 b9cc 0100 3fd7 0000 3e1f 0000 0004 000c 9950 000c 9950 0001 0050 0000 0000 ffff ffff
1122140  0100 3fdf 0000 3e1f 0000 0004 000c 99c8 000c 99c8 0001 0050 0000 0000 000c 8cec 0200 3fdf 0000 3e1f 0000 0008 000c 9a40
1122220  000c 9aa0 0001 0050 0000 0000 000b 1634 0100 3fe7 0000 3e1f 0000 0004 000c ec44 000c 9b9c 0001 0050 0000 0000 0000 3fe7
1122300  b464 0313 000a ffc0 000c 0b84 000c 8d2c 0200 3fe7 0000 3e1f 0000 0008 000c 9c1c 000c 9c50 0001 0050 0000 0000 0008 e4ac
1122360  0300 3fef 0000 3e1f 0000 000c 000c 9f74 000c 9f74 0001 0050 0000 0000 0000 3fef b328 0393 000a ed28 0000 0000 0008 e4cc
1122440  0200 3ff7 0000 3e1f 0000 0008 000c 96a8 000c 96a8 0001 0050 0000 0000 0000 3ff7 b328 0363 000a edc4 0000 0000 000c 8dcc
1122520  000a 3574 0008 e4ec 0200 3fff 0000 3e1f 0000 0008 000c 9788 000c 9788 0001 0050 0000 0000 0000 3fff b328 034b 000a ee9c
1122600  0000 0000 000c 8e04 000a 32c0 0008 e52c 0200 4007 0000 3e1f 0000 0008 000c 95a4 000c 95a4 0001 0050 0000 0000 0000 4007
1122660  b328 017b 000a efd4 0000 0000 000c 8e3c 000a 3894 0005 6572 726e 6f00 0000 002c 000c 2174 b27c b66c 0000 02b8 7fff ffff
1122740  000c ca7c 0200 0db5 0200 24bd 0000 3e1f 0000 400f 0000 315f 0029 2f68 6f6d 652f 6f73 6173 322f 622f 7175 696e 7475 732f
1123020  7077 312e 312f 6c69 6272 6172 792f 7479 7065 7300 002c 2f68 6f6d 652f 6f73 6173 322f 622f 7175 696e 7475 732f 7077 312e
1123100  312f 6c69 6272 6172 792f 7479 7065 732e 706c 0066 0034 2f68 6f6d 652f 6f73 6173 322f 622f 7175 696e 7475 732f 6765 6e65
1123160  7269 632f 7170 6c69 6232 2e35 2f6c 6962 7261 7279 2f74 7970 6573 0065 0037 2f68 6f6d 652f 6f73 6173 322f 622f 7175 696e
1123240  7475 732f 6765 6e65 7269 632f 7170 6c69 6232 2e35 2f6c 6962 7261 7279 2f74 7970 6573 2e70 6c00 7574 0000 0034 000a f084
1123320  b27c b66c 0000 02ba 7fff ffff 000c 8f94 0200 0db5 0400 24ad 0000 2907 0000 0023 0000 3e1f 0000 31c7 0000 315f 0000 0034
1123400  000c 8f60 b27c b66c 0000 02bb 7fff ffff 000c 722c 0200 0db5 0400 24ad 0000 2917 0000 001b 0000 3e1f 0000 31c7 0000 315f
1123460  000c 95fc 0000 05e4 b288 b66c 0000 02b9 7fff ffff 000c 8f94 0200 0db5 0100 15ad 0100 33fd 0200 0b3d 0000 1fd7 0000 000b
1123540  0000 315f 000c 902c 0000 0034 b288 b66c 0000 02b9 7fff ffff 000c 8fc8 0200 0db5 0100 15ad 0100 33fd 0200 0b3d 0000 1ff7
1123620  0000 000b 0000 315f 000c 9060 0000 0034 b288 b66c 0000 02b9 7fff ffff 000c 8ffc 0200 0db5 0100 15ad 0100 33fd 0200 0b3d
1123700  0000 240f 0000 000b 0000 315f 000c 9094 0000 0034 b288 b66c 0000 02b9 7fff ffff 000c 9030 0200 0db5 0100 15ad 0100 33fd
1123760  0200 0b3d 0000 2c1f 0000 000b 0000 315f 000c 90c8 0000 0034 b288 b66c 0000 02b9 7fff ffff 000c 9064 0200 0db5 0100 15ad
1124040  0100 33fd 0200 0b3d 0000 2edf 0000 000b 0000 315f 000c 90fc 0000 0034 b288 b66c 0000 02b9 7fff ffff 000c 9098 0200 0db5
1124120  0100 15ad 0100 33fd 0200 0b3d 0000 301f 0000 000b 0000 315f 000c 9130 0000 0034 b288 b66c 0000 02b9 7fff ffff 000c 90cc
1124200  0200 0db5 0100 15ad 0100 33fd 0200 0b3d 0000 309f 0000 0013 0000 315f 000c 9164 0000 0034 b288 b66c 0000 02b9 7fff ffff
1124260  000c 9100 0200 0db5 0100 15ad 0100 33fd 0200 0b3d 0000 28a7 0000 001b 0000 315f 000c 9198 0000 0034 b288 b66c 0000 02b9
1124340  7fff ffff 000c 9134 0200 0db5 0100 15ad 0100 33fd 0200 0b3d 0000 28a7 0000 0023 0000 315f 000c 91cc 0000 0034 b288 b66c
1124420  0000 02b9 7fff ffff 000c 9168 0200 0db5 0100 15ad 0100 33fd 0200 0b3d 0000 2ecf 0000 001b 0000 315f 000c 9200 0000 0034
1124500  b288 b66c 0000 02b9 7fff ffff 000c 919c 0200 0db5 0100 15ad 0100 33fd 0200 0b3d 0000 2ecf 0000 0023 0000 315f 000c 9234
```

```
1124560 0000 0034 b288 b66c 0000 02b9 7fff ffff 000c 91d0 0200 0db5 0100 15ad 0100 33fd 0200 0b3d 0000 28af 0000 001b 0000 315f
1124640 000c 9268 0000 0034 b288 b66c 0000 02b9 7fff ffff 000c 9204 0200 0db5 0100 15ad 0100 33fd 0200 0b3d 0000 28b7 0000 002b
1124720 0000 315f 000c 929c 0000 0034 b288 b66c 0000 02b9 7fff ffff 000c 9238 0200 0db5 0100 15ad 0100 33fd 0200 0b3d 0000 28bf
1125000 0000 001b 0000 315f 000c 92d0 0000 0034 b288 b66c 0000 02b9 7fff ffff 000c 926c 0200 0db5 0100 15ad 0100 33fd 0200 0b3d
1125060 0000 28c7 0000 001b 0000 315f 000c 9304 0000 0034 b288 b66c 0000 02b9 7fff ffff 000c 92a0 0200 0db5 0100 15ad 0100 33fd
1125140 0200 0b3d 0000 28cf 0000 001b 0000 315f 000c 9338 0000 0034 b288 b66c 0000 02b9 7fff ffff 000c 92d4 0200 0db5 0100 15ad
1125220 0100 33fd 0200 0b3d 0000 28d7 0000 001b 0000 315f 000c 936c 0000 0034 b288 b66c 0000 02b9 7fff ffff 000c 9308 0200 0db5
1125300 0100 15ad 0100 33fd 0200 0b3d 0000 28df 0000 001b 0000 315f 000c 93a0 0000 0034 b288 b66c 0000 02b9 7fff ffff 000c 933c
1125360 0200 0db5 0100 15ad 0100 33fd 0200 0b3d 0000 28e7 0000 001b 0000 315f 000c 93d4 0000 0034 b288 b66c 0000 02b9 7fff ffff
1125440 000c 9370 0200 0db5 0100 15ad 0100 33fd 0200 0b3d 0000 28ef 0000 001b 0000 315f 000c 9408 0000 0034 b288 b66c 0000 02b9
1125520 7fff ffff 000c 93a4 0200 0db5 0100 15ad 0100 33fd 0200 0b3d 0000 28f7 0000 001b 0000 315f 000c 943c 0000 0034 b288 b66c
1125600 0000 02b9 7fff ffff 000c 93d8 0200 0db5 0100 15ad 0100 33fd 0200 0b3d 0000 28ff 0000 001b 0000 315f 000c 9470 0000 0034
1125660 b288 b66c 0000 02b9 7fff ffff 000c 940c 0200 0db5 0100 15ad 0100 33fd 0200 0b3d 0000 2907 0000 0023 0000 315f 000c 94a4
1125740 000c 0034 b288 b66c 0000 02b9 7fff ffff 000c 9440 0200 0db5 0100 15ad 0100 33fd 0200 0b3d 0000 290f 0000 001b 0000 315f
1126020 000c 94d8 0000 0034 b288 b66c 0000 02b9 7fff ffff 000c 9474 0200 0db5 0100 15ad 0100 33fd 0200 0b3d 0000 2917 0000 001b
1126100 0000 315f 000c 950c 0000 0034 b288 b66c 0000 02b9 7fff ffff 000c 94a8 0200 0db5 0100 15ad 0100 33fd 0200 0b3d 0000 291f
1126160 0000 001b 0000 315f 000c 9544 0000 0038 b27c b66c 0000 02bc 0000 02ed 000c 9574 0200 0db5 0500 1cdd 0000 2def 0000 000b
1126240 0000 3e1f 0067 4ce3 0000 0283 0000 315f 000c 9570 0000 002c b4f0 b4e4 0000 02bb 7fff ffff 0008 b0dd 0000 0000 0000 0000
1126320 000c a178 0002 438a 000d 109c 000c 95fc 0000 0038 b27c b66c 0000 02be 0000 02ee 000c 9600 0200 0db5 0500 1cdd 0000 4007
1126400 0000 0013 0000 3e1f 0064 7163 0000 0283 0000 315f 2c78 0054 0002 438a 45d0 4714 329c 5aec 0200 4007 6d94 6dd8 3858 41e8
1126460 0000 000b 3bf4 0000 0008 cebc 001c 3858 4254 0000 0000 0013 3c48 0000 0008 cebc 001c 33a0 3818 3a4c 000c ea10 0014 3d30
1126540 3cf4 234c 000c aec4 000c 9674 0000 0038 b27c b66c 0000 02bf 0000 02ef 000c 9678 0200 0db5 0500 1cdd 0000 3fcf 0000 000b
1126620 0000 3e1f 0064 65e3 0000 0283 0000 315f 2c78 0040 0002 439a 45d0 329c 5d10 0000 0100 3fcf 6d94 3858 4254 0000 0000 000b
1126700 3bf4 0000 0008 cebc 0018 3310 3bf4 0000 000c ea58 0014 3d30 3cf4 234c 000c aec4 000c 9754 0000 0038 b27c b66c 0000 02c0
1126760 0000 02f0 000c 9758 0200 0db5 0500 1cdd 0000 3ff7 0000 0013 0000 3e1f 0064 6de3 0000 0283 0000 315f 2c78 00a8 0002 438a
1127040 45d0 4714 329c 5aec 0200 3ff7 6d94 6dd8 3858 41e8 0000 000b 3bf4 0000 0008 cebc 0020 3858 4254 0000 0000 0013 3c48 0000
1127120 0008 cebc 0020 2e7c ae74 001c 2ba0 0020 0022 320c 3bf4 0000 000c 8c9c 0020 aa88 001c 2e98 3bf4 0000 0008 b95c 001c 2c88
1127200 0004 2c58 2e7c ac08 2ba0 001c 001a 3818 54a8 a858 2e98 3310 3bf4 0000 000c ea58 001c 2c88 0012 2c58 33a0 3818 3bf4 0000
1127260 000c ea10 0014 3330 3cf4 234c 000c af28 000c 9834 0000 0038 b27c b66c 0000 02c1 0000 02f1 000c 9938 0200 0db5 0500 1cdd
1127340 0000 3fff 0000 0013 0000 3e1f 0064 6fa3 0000 0283 0000 315f 2c78 00a8 0002 438a 45d0 4714 329c 5aec 0200 3fff 6d94 6dd8
1127420 3858 41e8 0000 000b 3bf4 0000 0008 cebc 0020 3858 4254 0000 0000 0013 3c48 0000 0008 cebc 0020 2e7c ae74 001c 2ba0 0020
1127500 0022 320c 3bf4 0000 000c 8c9c 0020 aa88 001c 2e98 3bf4 0000 0008 b95c 001c 2c88 0004 2c58 2e7c ac08 2ba0 001c 001a 3818
1127560 54a8 a858 2e98 3310 3bf4 0000 000c ea58 001c 2c88 0012 2c58 33a0 3818 3bf4 0000 000c ea10 0014 3d30 3cf4 234c 000c af28
1127640 000c 991c 0000 0038 b27c b66c 0000 02c2 0000 02f2 000c 9920 0200 0db5 0500 1cdd 0000 3fc7 0000 0013 0000 3e1f 0064 64e3
1127720 0000 0283 0000 315f 27f0 0056 000c 98c0 45b8 4cc4 0000 2e07 33f4 41e8 0000 2ccf 31f0 247c 0008 bbfc 001c 32b8 24d0 0000
1130000 0008 bafc 001c 40a0 0008 e17c 0018 329c 24d0 0000 0008 dcfc 0018 408c 0008 e17c 0014 9314 9860 3d00 4a7c 000c 723c 4627
1130060 2954 0056 0002 430a 45b8 4cc4 0000 3067 33f4 41e8 0000 3387 31f0 247c 0008 bbfc 001c 32b8 24d0 0000 0008 bb9c 001c 40a0
1130140 0008 e19c 0018 329c 24d0 0000 0008 e6dc 0018 408c 0008 e19c 0014 9314 9860 3d00 4a7c 000c 723c 2070 000c 9994 0000 0038
1130220 b27c b66c 0000 02c3 0000 02f3 000c 9998 0200 0db5 0500 1cdd 0000 3fd7 0000 000b 0000 3e1f 0064 66e3 0000 0283 0000 315f
1130300 2c78 0040 0002 438a 45b8 9300 98c4 001a 4268 0000 0000 0003 4254 0000 ffff fffb 2420 0000 000c ea14 44c4 0000 0100 3fd7
1130360 6d0c 41e8 0000 000b 2420 0000 0008 cebc 000c 9a0c 0000 0038 b27c b66c 0000 02c4 0000 02f4 000c 9a10 0200 0db5 0500 1cdd
1130440 0000 3fdf 0000 000b 0000 3e1f 0064 67e3 0000 0283 0000 315f 2c78 0040 0002 438a 45b8 9300 98c4 001a 4268 0000 0000 0003
1130520 4254 0000 0000 0003 2420 0000 000c ea14 44c4 0000 0100 3fdf 6d0c 41e8 0000 000b 2420 0000 0008 cebc 000c 9af0 0000 0038
1130600 b27c b66c 0000 02c5 0000 02f5 000c 9af4 0200 0db5 0500 1cdd 0000 3fdf 0000 0013 0000 3e1f 0064 68e3 0000 0283 0000 315f
1130660 27f0 0034 000c 9aa0 45b8 3574 9300 9860 33bc 41e8 0000 0003 24d0 0000 000c eb1c 0014 2ecc 4268 0000 0000 0003 3d30 2340
1130740 000c ead4 0028 7e4e 2120 496e 7661 6c69 6420 6163 6365 7373 206d 6f64 6520 7e71 7e6e 2120 476f 616c 3a20 7e71 7e6e 0052
1131020 2954 004c 0002 438a 2520 46d8 332c 5b58 0200 3fdf 6b48 6d0c 3858 41e8 0000 000b 24d0 0000 0008 cebc 0014 4538 6d50 5370
1131100 4568 6d0c 6b74 41e8 0000 4697 4300 0000 0000 328f 0008 c11c 000c c5a8 000c 9be8 0000 00b0 b27c b66c 0000 02c6 0000 02f6
1131160 000c 9b6c 0200 0db5 0500 1cdd 0000 468f 0000 001b 0000 3e1f 0067 58e3 0000 0283 0000 315f 000c 9b68 0000 0040 0000 0000
1131240 0000 0000 000c ed0c 0000 0000 000c ec78 000c eec4 000c ea30 000c ee8d 000c eab4 000c ef19 000c eb90 000c ee4d 000c ea68
1131320 000c ea78 000c 9be8 0000 0038 b27c b66c 0000 02c7 0000 02f7 000c 9bec 0200 0db5 0500 1cdd 0000 3fe7 0000 000b 0000 3e1f
1131400 0064 69e3 0000 0283 0000 315f 2954 0048 0002 438a 45d0 329c 5d10 0000 0100 3fe7 6d94 3858 4254 0000 0000 000b 3bf4 0000
1131460 0008 cebc 0018 33a0 4254 0000 0000 0003 3bf4 0000 000c ead4 0014 3d30 3cf4 234c 000c aec4 000c 9ce0 0000 0038 b27c b66c
1131540 0000 02c8 0000 02f8 000c 9ce4 0200 0db5 0500 1cdd 0000 3fe7 0000 0013 0000 3e1f 0064 6b63 0000 0283 0000 315f 27f0 0034
1131620 000c 9c50 45b8 3574 9300 9860 33bc 41e8 0000 0003 24d0 0000 000c eb1c 0014 41fc 0000 0003 3d30 39a4 000c ead4 000c 2eb0
```

```
1131700  2954 008c 0002 438a 45dc 46d8 329c 5aec 0200 3fe7 6dd8 6d0c 3858 41e8 0000 000b 3c48 0000 0008 cebc 0024 2e7c ae74 0020
1131760  2ba0 0024 0034 3410 001c 41e8 0000 0003 3b4c 0000 000c eb1c 0024 aa88 0020 2e98 33d8 3e70 001c 3aa0 000c ead4 0018 3d30
1132040  3d0c 234c 000c aec4 2c58 4538 6d50 5370 4568 6d0c 6b74 41e8 0000 4697 4300 0000 0000 328f 0008 c11c 000c c5a8 000c 9d54
1132120  0000 0038 b27c b66c 0000 02c9 0000 02f9 000c 9d58 0200 0db5 0500 1cdd 0000 3fb7 0000 0013 0000 3e1f 0064 52c3 0000 0283
1132200  0000 315f 0038 7e4e 2120 4361 6e27 7420 6f70 656e 2027 7e77 2720 696e 207e 7720 6d6f 6465 2e7e 6e21 2055 4e49 5820 6572
1132260  726f 7220 7e77 2028 7e77 292e 7e6e 0065 000c 9e80 0000 0038 b27c b66c 0000 02ca 0000 02fa 000c 9e84 0200 0db5 0500 1cdd
1132340  0000 3fb7 0000 001b 0000 3e1f 0064 62e3 0000 0283 0000 315f 2c78 00f4 0002 438a 45b8 46ec 4790 0020 32f0 0028 5d10 0000
1132420  0300 3fb7 6d0c 6d50 6e1c 0020 3894 0028 4254 0000 0000 000b 3b4c 0000 0008 cebc 002c 3244 3410 0024 382c 0028 3ba0 0000
1132500  000c ecdc 002c 3f68 0028 41fc 0000 001b 4538 43f8 0000 46af 5370 4550 4b8c 0000 0000 21ef 6b74 3c9c 0000 0020 0008 ce7c
1132560  0028 3410 001c 3e70 0024 39a4 000c ecfc 0024 2ba0 0024 0012 37c4 001c 4e1c 0000 0000 0003 2ecc 723c 2c30 0012 37c4 0020
1132640  4e1c 0000 0000 21ef 2ecc c5a8 2c58 33f4 3348 411c 0000 001c 000c aefc 001c 4538 6dd8 5370 4550 6d94 6b74 4538 6d50 6bb4
1132720  4568 6d0c 6b74 41e8 0000 46bf 4300 0000 0000 328f 0008 c11c 000c c5a8 000c 9f40 0000 0070 b27c b66c 0000 02cb 0000 02fb
1133000  000c 9ebc 0200 0db5 0500 1cdd 0000 46a7 0000 0023 0000 3e1f 0067 66e3 0000 0283 0000 315f 000c 9f40 0000 0038 b27c b66c
1133060  0000 02cc 0000 02fc 000c 9f44 0200 0db5 0500 1cdd 0000 46a7 0000 001b 0000 3e1f 0067 7063 0000 0283 0000 315f 2c78 0050
1133140  0002 438a 36a4 41fc 0000 0013 4598 0018 4b8c 0000 0000 46c7 5370 4550 4b8c 0000 0000 1d17 6c84 0018 4598 0018 4b8c 0000
1133220  0000 3387 6bb4 4550 4b8c 0000 0000 2ccf 6c84 0018 239c 0000 0008 ce7c 000c 9ff4 0000 0038 b27c b66c 0000 02cd 0000 02fd
1133300  000c 9ff8 0200 0db5 0500 1cdd 0000 3fef 0000 001b 0000 3e1f 0064 6c63 0000 0283 0000 315f 2c78 007c 0002 438a 45b8 4714
1133360  4768 32f0 0020 5aec 0300 3fef 6d0c 6dd8 6d94 3894 0020 41e8 0000 000b 3b4c 0000 0008 cebc 0028 344c 3410 0024 382c 0020
1133440  3c48 0000 000c ecdc 0028 3410 001c 3e70 0024 39a4 000c ecfc 0024 3e70 0020 411c 0000 001c 000c aec4 001c 37dc 3c48 0000
1133520  000c ee64 0018 386c 3d30 2340 0008 d3dc 000c a09c 0000 0038 b27c b66c 0000 02ce 0000 02fe 000c a0a0 0200 0db5 0500 1cdd
1133600  0000 46cf 0000 0013 0000 3e1f 0067 7323 0000 0283 0000 315f 2938 0070 000c eeb8 4e1c 0000 0000 46c7 2520 46d8 3050 3364
1133660  3b4c 0000 0008 cefc 001c 33d8 4538 4af8 0000 025b 5370 4550 4b8c 0000 0000 020b 6b74 4538 4b8c 0000 0000 0213 6bb4 4550
1133740  4b8c 0000 0000 0173 6b74 40a0 000b 8848 0018 343c 329c 247c 0008 cefc 0014 3228 3d30 2340 000c ea10 000c a100 0000 0038
1134020  b27c b66c 0000 02cf 0000 02ff 000c a104 0200 0db5 0500 1cdd 0000 3fbf 0000 0003 0000 3e1f 0064 63e3 0000 0283 0000 315f
1134100  2c78 002c 0002 438a 2520 2ba0 0010 001a 33a0 320c 31f0 247c 0008 bbfc 0010 4064 0008 b95c 000c c5a8 2c58 22a0 000c a40c
1134160  0000 0268 b130 b66c 0000 035f 0000 0395 000c 7849 0200 0db5 0500 1cdd 0000 48b7 0000 001b 0000 473f 006b d8c3 0000 029b
1134240  0000 315f 000c a174 0000 003c 5d10 0000 0100 3037 4b8c 0000 0000 46d7 5758 4af8 0000 4677 55f0 4af8 0000 467f 55f0 4af8
1134320  0000 4687 55f0 4af8 0000 46b7 5370 228c 000c a22c 0000 00b8 b27c b66c 0000 035e 0000 0394 000c a104 0200 0db5 0500 1cdd
1134400  0000 48b7 0000 0013 0000 473f 006b d563 0000 029b 0000 315f 000c a40c 0000 0080 0000 0000 0000 0000 0000 0000 0000 0000
1134460  0000 0000 0000 0000 0000 0000 0000 0000 0000 0000 0000 0000 0000 0000 0000 0000 0000 0000 0000 0000 0000 0000 000c eb2c
1134540  0000 0000 0000 0000 000c ed0c 0000 0000 000c ec78 000c eec4 000c ea30 000c ee8d 000c ef7d 000c ef19 000c eb90 000c ee34
1134620  000c ea68 000c ea78 000c a280 0000 0054 4e1c 0000 0000 4677 5d7c 0000 0300 4677 6784 6160 5de8 0000 0100 0ab7 4b8c 0000
1134700  0000 2fdf 5d7c 0000 0100 0ab7 4b8c 0000 0000 2fdf 56f8 671c 5370 5aec 0100 0ad7 4b8c 0000 0000 253f 228c 206f 000c a2c0
1134760  0000 0040 4e1c 0000 0000 467f 5d7c 0000 0200 467f 6160 5b58 0100 0ab7 4b8c 0000 0000 2fdf 56f8 671c 5370 5aec 0100 0ad7
1135040  4b8c 0000 0000 253f 228c 322c 000c a314 0000 0054 4e1c 0000 0000 4687 5d7c 0000 0300 4687 6784 6160 5de8 0000 0100 0ab7
1135120  4b8c 0000 0000 2fdf 5d7c 0000 0100 0ab7 4b8c 0000 0000 253f 56f8 671c 5370 5aec 0100 0ad7 4b8c 0000 0000 253f 228c 6d65
1135200  000c a4cc 0000 0054 4e1c 0000 0000 46b7 5d7c 0000 0300 46b7 6784 6160 5de8 0000 0100 0ab7 4b8c 0000 0000 2fdf 5d7c 0000
1135260  0100 0ab7 4b8c 0000 0000 253f 56f8 671c 5370 5aec 0100 0ad7 4b8c 0000 0000 253f 228c 2072 0036 2f68 6f6d 652f 6f73 6173
1135340  322f 622f 7175 696e 7475 732f 6765 6e65 7269 632f 7170 6c69 6232 2e35 2f6c 6962 7261 7279 2f65 6163 6365 7373 0074 7927
1135420  0039 2f68 6f6d 652f 6f73 6173 322f 622f 7175 696e 7475 732f 6765 6e65 7269 632f 7170 6c69 6232 2e35 2f6c 6962 7261 7279
1135500  2f65 6163 6365 7373 2e70 6c00 0000 002c 000c 6ae8 b27c b66c 0000 02d4 7fff ffff 000b 01a8 0200 0db5 0200 2f35 0000 46ef
1135560  0000 0293 0000 315f 000c a598 0000 c0d0 b288 b66c 0000 02d3 7fff ffff 000c a3e4 0200 0db5 0100 15ad 0100 33fd 0000 000b
1135640  0000 315f 000c a478 0000 0040 b27c b66c 0000 02d5 0000 02dc 000a e5b4 0200 0db5 0500 26f5 0000 1fc7 0000 26ef 0000 0293
1135720  0200 09cd 0000 01cb 0000 002b 0000 3a2f 0000 315f 000c a4a4 0000 002c b27c b66c 0000 02d6 0000 02dd 000a d16d 0200 0db5
1136000  0200 270d 0000 46ef 0000 3287 0000 315f 000c a598 0300 0038 b27c b66c 0000 02d7 0000 02df 000c 9549 0200 0db5 0500 1cdd
1136060  0000 22df 0000 0013 0000 3287 0067 81c3 0000 0293 0000 315f 0041 2f68 6f6d 652f 6f73 6173 322f 622f 7175 696e 7475 732f
1136140  6765 6e65 7269 632f 7170 6c69 6232 2e35 2f6c 6962 7261 7279 2f73 756e 342d 342e 302f 6561 6363 6573 732e 6f00 003f 2f68
1136220  6f6d 652f 6f73 6173 322f 622f 7175 696e 7475 732f 6765 6e65 7269 632f 7170 6c69 6232 2e35 2f6c 6962 7261 7279 2f73 756e
1136300  342d 342f 6561 6363 6573 732e 6f00 6720 0000 002c 000c ca48 b27c b66c 0000 02de 7fff ffff 000b 0200 0200 0db5 0200 224d
1136360  0000 46ef 0000 3287 0000 315f 000d 10a0 0000 0000 000c c968 0000 08d0 b4f0 b4e4 0000 02d7 7fff ffff 0008 abfd 0000 0000
1136440  0000 0000 000c a568 0002 438a 000d 109c 000c c968 0000 08a4 6f6e 6469 7469 6f6e 2729 2e0a 6572 726e 6f28 3739 2c09 2745
1136520  4e4f 4c43 4b27 2c09 274e 6f20 7265 636f 7264 206c 6f63 6b73 2061 7661 696c 6162 6c65 2729 2e0a 6572 726e 6f28 3830 2c09
1136600  2745 4e4f 4e45 5427 2c09 274d 6163 6869 6e65 2069 7320 6e6f 7420 6f6e 2074 6865 206e 6574 776f 726b 2729 2e0a 6572 726e
1136660  6f28 3831 2c09 2745 5252 454d 4f54 4527 2c09 274f 626a 6563 7420 6973 2072 656d 6f74 6527 292e 0a65 7272 6e6f 2838 322c
1136740  0927 454e 4f4c 494e 4b27 2c09 2774 6865 206c 696e 6b20 6861 7320 6265 656e 2073 6576 6572 6564 2729 2e0a 6572 726e 6f28
```

```
1137020 3833 2c09 2745 4144 5627 2c09 2761 6476 6572 7469 7365 2065 7272 6f72 2729 2e0a 6572 726e 6f28 3834 2c09 2745 5352 4d4e
1137100 5427 2c09 2773 726d 6f75 6e74 2065 7272 6f72 2729 2e0a 6572 726e 6f28 3835 2c09 2745 434f 4d4d 272c 0927 436f 6d6d 756e
1137160 6963 6174 696f 6e20 6572 726f 7220 6f6e 2073 656e 6427 292e 0a65 7272 6e6f 2838 362c 0927 4550 524f 544f 272c 0927 5072
1137240 6f74 6f63 6f6c 2065 7272 6f72 2729 2e0a 6572 726e 6f28 3837 2c09 2745 4d55 4c54 4948 4f50 272c 0927 6d75 6c74 6968 6f70
1137320 2061 7474 656d 7074 6564 2729 2e0a 6572 726e 6f28 3838 2c09 2745 444f 5444 4f54 272c 0927 4372 6f73 7320 6d6f 756e 7420
1137400 706f 696e 7420 286e 6f74 2061 6e20 6572 726f 7229 2729 2e0a 6572 726e 6f28 3839 2c09 2745 5245 4d43 4847 272c 0927 5265
1137460 6d6f 7465 2061 6464 7265 7373 2063 6861 6e67 6564 2729 2e0a 0a25 2045 7272 6f72 7320 7370 6563 6966 6963 2074 6f20 7468
1137540 6520 5175 696e 7475 7320 5072 6f6c 6f67 206c 6962 7261 7279 0a0a 6572 726e 6f28 3939 362c 0927 4555 4e49 4d50 272c 0927
1137620 4f70 6572 6174 696f 6e20 6e6f 7420 696d 706c 656d 656e 7465 6427 292e 0a65 7272 6e6f 2839 3937 2c09 2745 4e4f 5441 5243
1137700 4827 2c09 2741 7263 6869 7665 206e 6f74 2069 6e20 6172 2835 2920 666f 726d 6174 2729 2e0a 6572 726e 6f28 3939 382c 0927
1137760 454e 4f54 4d45 4142 272c 0927 4d65 6d62 6572 206e 6f74 2070 7265 7365 6e74 2069 6e20 6172 6368 6976 6527 292e 0a65 7272
1140040 6e6f 2839 3939 2c09 2745 554e 4b56 4152 272c 0927 2476 6172 6961 626c 6520 6e6f 7420 6465 6669 6e65 6420 696e 2065 6e76
1140120 6972 6f6e 6d65 6e74 2729 2e0a 0a25 2045 7272 6f72 2073 7065 6369 6669 6320 746f 2056 4d53 0a0a 6572 726e 6f28 3635 3533
1140200 352c 0927 4556 4d53 4552 5227 2c09 2755 6e74 7261 6e73 6c61 7465 6162 6c65 2056 4d53 2065 7272 6f72 2729 2e0a 000c a942
1140260 0000 032b 000c a94a 0000 03bb 000c a952 0000 0373 000c a95a 0000 032b 000c a962 0000 03bb 000c a96a 0000 017b 000c a972
1140340 0000 03b3 000c a97a 0000 019b 000c a982 0000 0173 000c a98a 0000 018b 000c a992 0000 017b 000c a99a 0000 0393 000c a9a2
1140420 0000 03ab 000c a9aa 0000 0373 0000 0007 0000 0173 000c a9ba 0000 0383 000c a9c2 0000 0363 0000 0007 0000 0373 000c ab72
1140500 0000 017b 0000 0007 0000 0343 000c a9d2 0000 037b 000c a9da 0000 036b 000c a9e2 0000 032b 000c a9ea 0000 017b 000c a9f2
1140560 0000 037b 000c a9fa 0000 039b 000c aa02 0000 030b 000c aa0a 0000 039b 000c aa12 0000 018b 000c aa1a 0000 017b 000c aa22
1140640 0000 030b 000c aa2a 0000 017b 000c aa32 0000 03b3 000c aa3a 0000 034b 000c aa42 0000 0353 000c aa4a 0000 030b 000c aa52
1140720 0000 03cb 000c aa5a 0000 017b 000c aa62 0000 02b3 000c aa6a 0000 0243 000c aa72 0000 0223 000c aa7a 0000 0263 000c aa82
1141000 0000 017b 000c aa8a 0000 0383 000c aa92 0000 030b 000c aa9a 0000 0393 000c aaa2 0000 039b 000c aaaa 0000 032b 000c aab2
1141060 0000 0393 000c aaba 0000 017b 000c aac2 0000 0383 000c aaca 0000 0393 000c aad2 0000 037b 000c aada 0000 0363 000c aae2
1141140 0000 037b 000c aaea 0000 033b 000c aaf2 0000 017b 000c aafa 0000 0373 000c ab02 0000 032b 000c ab0a 0000 03bb 000c ab12
1141220 0000 0373 000c ab1a 0000 032b 000c ab22 0000 03bb 000c ab2a 0000 017b 000c ab32 0000 03b3 000c ab3a 0000 019b 000c ab42
1141300 0000 0173 000c ab4a 0000 018b 000c ab52 0000 017b 000c ab5a 0000 0393 000c ab62 0000 03ab 000c ab6a 0000 0373 000c ab72
1141360 0000 017b 000c ab8a 0000 0343 000c ab92 0000 037b 000c ab9a 0000 036b 000c aba2 0000 032b 000c abaa 0000 017b 000c abb2
1141440 0000 037b 000c abba 0000 039b 000c abc2 0000 030b 000c abca 0000 039b 000c abd2 0000 018b 000c abda 0000 017b 000c abe2
1141520 0000 030b 000c abea 0000 017b 000c abf2 0000 03b3 000c abfa 0000 034b 000c ac02 0000 0353 000c ac0a 0000 030b 000c ac12
1141600 0000 03cb 000c ac1a 0000 017b 000c ac22 0000 02b3 000c ac2a 0000 0243 000c ac32 0000 0223 000c ac3a 0000 0263 000c ac42
1141660 0000 017b 000c ac4a 0000 0383 000c ac52 0000 030b 000c ac5a 0000 0393 000c ac62 0000 039b 000c ac6a 0000 032b 000c ac72
1141740 0000 0393 000c ac7a 0000 017b 000c ac82 0000 0383 000c ac8a 0000 0393 000c ac92 0000 037b 000c ac9a 0000 0363 000c aca2
1142020 0000 037b 000c acaa 0000 033b 000c acb2 0000 017b 000c acba 0000 0373 000c acc2 0000 032b 000c acca 0000 03bb 000c acd2
1142100 0000 0373 000c acda 0000 032b 000c ace2 0000 03bb 000c acea 0000 017b 000c acf2 0000 03b3 000c acfa 0000 019b 000c ad02
1142160 0000 0173 000c ad0a 0000 018b 000c ad12 0000 017b 000c ad1a 0000 0393 000c ad22 0000 03ab 000c ad2a 0000 0373 000c a9b2
1142240 0000 2473 000c ad3a 0000 0533 0000 0007 0016 2e43 000c ad4a 0001 88e3 0000 0007 0000 017b 000c ad5a 0000 0343 000c ad62
1142320 0000 037b 000c ad6a 0000 036b 000c ad72 0000 032b 000c ad7a 0000 017b 000c ad82 0000 037b 000c ad8a 0000 039b 000c ad92
1142400 0000 030b 000c ad9a 0000 039b 000c ada2 0000 018b 000c adaa 0000 017b 000c adb2 0000 030b 000c adba 0000 017b 000c adc2
1142460 0000 03b3 000c adca 0000 034b 000c add2 0000 0353 000c adda 0000 030b 000c ade2 0000 03cb 000c adea 0000 017b 000c adf2
1142540 0000 02b3 000c adfa 0000 0243 000c ae02 0000 0223 000c ae0a 0000 0263 000c ae12 0000 017b 000c ae1a 0000 0383 000c ae22
1142620 0000 030b 000c ae2a 0000 0393 000c ae32 0000 039b 000c ae3a 0000 032b 000c ae42 0000 0393 000c ae4a 0000 017b 000c ae52
1142700 0000 0383 000c ae5a 0000 0393 000c ae62 0000 037b 0000 402f b328 0363 000b 01ac 0000 0000 000c ae64 000a f1b4 0000 47d7
1142760 b328 017b 000c 6d50 0000 0000 0000 402f b328 0000 000b 0204 0000 0000 0000 400f b328 0373 000b 0270 0000 0000 000c ae9c
1143040 000c 0c84 0008 e54c 0200 400f 0300 400f 0000 0008 000c b0e0 000b 04bc 0001 0051 0000 0000 0000 400f b464 018b 000b 029c
1143120 000c af0c 000c aed4 000a 38c0 000c aeb4 0300 400f 0000 400f 0000 000c 000c b128 000c b128 0001 0051 0000 0000 b464 af12
1143200 000b 02d0 0000 0000 0008 e58c 0200 4037 0000 400f 0000 0008 000c b00c 000b 0410 0001 0051 0000 0000 0000 4037 b328 036b
1143260 000b 0304 0000 0000 001f 2240 2823 2938 392f 3038 2f32 3920 6572 726e 6f2e 6564 2020 2020 3333 2e31 2200 af6e 000c 8970
1143340 0100 2def 0000 400f 0000 0004 000c afbc 000c afbc 0001 0051 0000 0000 0000 3e1f b328 af96 000c e9b8 0000 0000 0000 400f
1143420 b328 afa6 000c 8b24 0000 0000 000c 09fc 0000 0000 000c af9c 000c afac 2cac 017b 0002 438a 2ca0 02b3 0000 0000 0000 0001
1143500 000a a558 000a a558 0002 438a 000a effc 0000 2907 b464 017b 000c 8f64 0016 b074 0004 506c 7573 0000 2938 0012 000c b030
1143560 4e1c 0000 0000 0003 2edc b00e 27f0 032b 000c b030 2ca0 0393 0000 0000 0000 0001 000c aff8 000c b030 0002 438a 000a f0b0
1143640 28c4 0022 000b 03c8 252c 41e3 0000 2a8f 4300 0000 0000 225f 0008 d6dc 000c 2ecc c5a8 b056 0024 7e4e 2120 554e 4958 2065
1143720 7272 6f72 207e 7720 287e 7729 7e6e 2120 476f 616c 3a20 7e71 7e6e 007e 0022 7e4e 2120 556e 6b6e 6f77 6e20 6572 726f 7220
1144000 7e77 7e6e 2120 476f 616c 3a20 7e71 7e6e 000c b0a6 0000 3e1f b328 b0ae 000c 8e68 0000 0000 0000 47df b328 b0a4 000c 6d84
1144060 0000 0000 0004 456e 756d 0000 2938 0012 000b 0478 4e1c 0000 0000 0003 2edc 0db7 27f0 b0d5 000b 0478 2ca0 0db7 0000 0000
```

```
1144140  0000 0001 000c b0cc 000b 0478 0002 438a 000a eec4 0003 454f 4b00 b0fe 27f0 001c 000c b160 4e1c 0000 0000 0003 5230 0000
1144220  0000 4057 0000 405f 2cac b116 0002 438a 2ca0 0003 0000 01fc 0000 005f 000c b10c 000c c8f0 0002 438a 000b 0e60 0005 4550
1144300  4552 4d00 0009 4e6f 7420 6f77 6e65 7200 28c4 001c 000c b1ac 4e1c 0000 0000 000b 5230 0000 0000 4067 0000 406f 0005 4553
1144360  5243 4800 0006 454e 4f45 4e54 000c b192 0019 4e6f 2073 7563 6820 6669 6c65 206f 7220 6469 7265 6374 6f72 7900 28c4 001c
1144440  000c b1ec 4e1c 0000 0000 0013 5230 0000 0000 4077 0000 407f 000b 4e6f 2063 6869 6c64 7265 6e00 b1f8 000f 4e6f 2073 7563
1144520  6820 7072 6f63 6573 7300 034b 28c4 001c 000c b22c 4e1c 0000 0000 001b 5230 0000 0000 4087 0000 408f 0005 4549 4e54 5200
1144600  0017 496e 7465 7272 7570 7465 6420 7379 7374 656d 2063 616c 6c00 0263 28c4 001c 000c b27c 4e1c 0000 0000 0023 5230 0000
1144660  0000 4097 0000 409f 001d 4f70 6572 6174 696f 6e20 616c 7265 6164 7920 696e 2070 726f 6772 6573 7300 0003 4549 4f00 b272
1144740  0009 492f 4f20 6572 726f 7200 28c4 001c 000c b2bc 4e1c 0000 0000 002b 5230 0000 0000 40a7 0000 40af 0005 454e 5849 4f00
1145020  0019 4e6f 2073 7563 6820 6465 7669 6365 206f 7220 6164 6472 6573 7300 28c4 001c 000c b2f4 4e1c 0000 0000 0033 5230 0000
1145100  0000 40b7 0000 40bf 0005 4532 4249 4700 0011 4172 6720 6c69 7374 2074 6f6f 206c 6f6e 6700 28c4 001c 000c b330 4e1c 0000
1145160  0000 003b 5230 0000 0000 40c7 0000 40cf 0007 454e 4f45 5845 4300 0373 0011 4578 6563 2066 6f72 6d61 7420 6572 726f 7200
1145240  28c4 001c 000c b368 4e1c 0000 0000 0043 5230 0000 0000 40d7 0000 40df 0005 4542 4144 4600 000f 4261 6420 6669 6c65 206e
1145320  756d 6265 7200 b36a 28c4 001c 000c b390 4e1c 0000 0000 004b 5230 0000 0000 40e7 0000 40ef 0006 4543 4849 4c44 000c b392
1145400  28c4 001c 000c b3cc 4e1c 0000 0000 0053 5230 0000 0000 40f7 0000 40ff 0006 4541 4741 494e 000c b3ba 0011 4e6f 206d 6f72
1145460  6520 7072 6f63 6573 7365 7300 28c4 001c 000c b408 4e1c 0000 0000 005b 5230 0000 0000 4107 0000 410f 0006 454e 4f4d 454d
1145540  0000 0223 000f 4e6f 7420 656e 6f75 6768 2063 6f72 6500 b40a 28c4 001c 000c b444 4e1c 0000 0000 0063 5230 0000 0000 4117
1145620  0000 411f 0006 4541 4343 4553 000c b432 0011 5065 726d 6973 7369 6f6e 2064 656e 6965 6400 28c4 001c 000c b47c 4e1c 0000
1145700  0000 006b 5230 0000 0000 4127 0000 412f 0006 4546 4155 4c54 0000 033b 000b 4261 6420 6164 6472 6573 7300 0373 28c4 001c
1145760  000c b4a4 4e1c 0000 0000 0073 5230 0000 0000 4137 0000 413f 0007 454e 4f54 424c 4b00 03bb 28c4 001c 000c b4dc 4e1c 0000
1146040  0000 007b 5230 0000 0000 4147 0000 414f 0005 4542 5553 5900 0011 4d6f 756e 7420 6465 7669 6365 2062 7573 7900 28c4 001c
1146120  000c b514 4e1c 0000 0000 0083 5230 0000 0000 4157 0000 415f 0006 4545 5849 5354 0056 8763 000b 4669 6c65 2065 7869 7374
1146200  7300 b510 28c4 001c 000c b54c 4e1c 0000 0000 008b 5230 0000 0000 4167 0000 416f 0005 4558 4445 5600 0011 4372 6f73 732d
1146260  6465 7669 6365 206c 696e 6b00 28c4 001c 000c b588 4e1c 0000 0000 0093 5230 0000 0000 4177 0000 417f 0006 454e 4f44 4556
1146340  000c b576 000e 4e6f 2073 7563 6820 6465 7669 6365 000c b57d 28c4 001c 000c b5c4 4e1c 0000 0000 009b 5230 0000 0000 4187
1146420  0000 418f 0007 454e 4f54 4449 5200 0db7 000f 4e6f 7420 6120 6469 7265 6374 6f72 7900 315f 28c4 001c 000c b600 4e1c 0000
1146500  0000 00a3 5230 0000 0000 4197 0000 419f 0006 4549 5344 4952 0000 0007 000e 4973 2061 2064 6972 6563 746f 7279 0000 2177
1146560  28c4 001c 000c b63c 4e1c 0000 0000 00ab 5230 0000 0000 41a7 0000 41af 0006 4549 4e56 414c 0000 270f 0010 496e 7661 6c69
1146640  6420 6172 6775 6d65 6e74 0007 28c4 001c 000c b664 4e1c 0000 0000 00b3 5230 0000 0000 41b7 0000 41bf 0006 454e 4649 4c45
1146720  000c b660 28c4 001c 000c b6a4 4e1c 0000 0000 00bb 5230 0000 0000 41c7 0000 41cf 0006 454d 4649 4c45 000c b688 0013 546f
1147000  6f20 6d61 6e79 206f 7065 6e20 6669 6c65 7300 b6ae 28c4 001c 000c b6e0 4e1c 0000 0000 00c3 5230 0000 0000 41d7 0000 41df
1147060  0006 454e 4f54 5459 0000 2677 0010 4e6f 7420 6120 7479 7065 7772 6974 6572 008f 28c4 001c 000c b71c 4e1c 0000 0000 00cb
1147140  5230 0000 0000 41e7 0000 41ef 0007 4554 5854 4253 5900 b6fd 000e 5465 7874 2066 696c 6520 6275 7379 0000 3e17 28c4 001c
1147220  000c b754 4e1c 0000 0000 00d3 5230 0000 0000 41f7 0000 41ff 0005 4546 4249 4700 000e 4669 6c65 2074 6f6f 206c 6172 6765
1147300  0000 3e1f 28c4 001c 000c b798 4e1c 0000 0000 00db 5230 0000 0000 4207 0000 420f 0006 454e 4f53 5043 0000 0db7 0017 4e6f
1147360  2073 7061 6365 206c 6566 7420 6f6e 2064 6576 6963 6500 b79d 28c4 001c 000c b7d0 4e1c 0000 0000 00e3 5230 0000 0000 4217
1147440  0000 421f 0006 4553 5049 5045 0000 2677 000c 496c 6c65 6761 6c20 7365 656b 00bf 28c4 001c 000c b80c 4e1c 0000 0000 00eb
1147520  5230 0000 0000 4227 0000 422f 0005 4552 4f46 5300 0015 5265 6164 2d6f 6e6c 7920 6669 6c65 2073 7973 7465 6d00 28c4 001c
1147600  000c b848 4e1c 0000 0000 00f3 5230 0000 0000 4237 0000 423f 0006 454d 4c49 4e4b 000c b76e 000e 546f 6f20 6d61 6e79 206c
1147660  696e 6b73 000c b836 28c4 001c 000c b87c 4e1c 0000 0000 00fb 5230 0000 0000 4247 0000 424f 0005 4550 4950 4500 000b 4272
1147740  6f6b 656e 2070 6970 6500 0003 28c4 001c 000c b8b8 4e1c 0000 0000 0103 5230 0000 0000 4257 0000 425f 0004 4544 4f4d 0085
1150020  0012 4172 6775 6d65 6e74 2074 6f6f 206c 6172 6765 0000 2177 28c4 001c 000c b8f4 4e1c 0000 0000 010b 5230 0000 0000 4267
1150100  0000 426f 0006 4552 414e 4745 000c b8cd 0010 5265 7375 6c74 2074 6f6f 206c 6172 6765 0057 28c4 001c 000c b938 4e1c 0000
1150160  0000 0113 5230 0000 0000 4277 0000 427f 000b 4557 4f55 4c44 424c 4f43 4b00 b90d 0015 4f70 6572 6174 696f 6e20 776f 756c
1150240  6420 626c 6f63 6b00 28c4 001c 000c b980 4e1c 0000 0000 011b 5230 0000 0000 4287 0000 428f 000b 4549 4e50 524f 4752 4553
1150320  5300 2677 0019 4f70 6572 6174 696f 6e20 6e6f 7720 696e 2070 726f 6772 6573 7300 28c4 001c 000c b9a8 4e1c 0000 0000 0123
1150400  5230 0000 0000 4297 0000 429f 0008 4541 4c52 4541 4459 005f 28c4 001c 000c b9f4 4e1c 0000 0000 012b 5230 0000 0000 42a7
1150460  0000 42af 0008 454e 4f54 534f 434b 00e3 001e 536f 636b 6574 206f 7065 7261 7469 6f6e 206f 6e20 6e6f 6e2d 736f 636b 6574
1150540  0000 315f 28c4 001c 000c ba40 4e1c 0000 0000 0133 5230 0000 0000 42b7 0000 42bf 000c 4544 4553 5441 4444 5252 4551 00b1
1150620  001c 4465 7374 696e 6174 696f 6e20 6164 6472 6573 7320 7265 7175 6972 6564 0057 28c4 001c 000c ba7c 4e1c 0000 0000 013b
1150700  5230 0000 0000 42c7 0000 42cf 0008 454d 5347 5349 5a45 00af 0010 4d65 7373 6167 6520 746f 6f20 6c6f 6e67 0036 28c4 001c
1150760  000c bacc 4e1c 0000 0000 0143 5230 0000 0000 42d7 0000 42df 000a 4550 524f 544f 5459 5045 0000 2cb7 001e 5072 6f74 6f63
1151040  6f6c 2077 726f 6e67 2074 7970 6520 666f 7220 736f 636b 6574 000c bace 28c4 001c 000c bb14 4e1c 0000 0000 014b 5230 0000
1151120  0000 42e7 0000 42ef 000b 454e 4f50 524f 544f 4f50 5400 039b 0016 5072 6f74 6f63 6f6c 206e 6f74 2061 7661 696c 6162 6c65
1151200  000c bb16 28c4 001c 000c bb60 4e1c 0000 0000 0153 5230 0000 0000 42f7 0000 42ff 000f 4550 524f 544f 4e4f 5355 5050 4f52
```

| | | | | | | | | | | | | | | | | | | | | | | | | |
|---|---|---|---|---|---|---|---|---|---|---|---|---|---|---|---|---|---|---|---|---|---|---|---|---|
| 1151260 | 5400 | bb46 | 0016 | 5072 | 6f74 | 6f63 | 6f6c | 206e | 6f74 | 2073 | 7570 | 706f | 7274 | 6564 | 0000 | 039b | 28c4 | 001c | 000c | bbac | 4e1c | 0000 | 0000 | 015b |
| 1151340 | 5230 | 0000 | 0000 | 4307 | 0000 | 430f | 000f | 4553 | 4f43 | 4b54 | 4e4f | 5355 | 5050 | 4f52 | 5400 | 017b | 0019 | 536f | 636b | 6574 | 2074 | 7970 | 6520 | 6e6f |
| 1151420 | 7420 | 7375 | 7070 | 6f72 | 7465 | 6400 | 28c4 | 001c | 000c | bbfc | 4e1c | 0000 | 0000 | 0163 | 5230 | 0000 | 0000 | 4317 | 0000 | 431f | 000a | 454f | 504e | 4f54 |
| 1151500 | 5355 | 5050 | 0000 | 038b | 0021 | 4f70 | 6572 | 6174 | 696f | 6e20 | 6e6f | 7420 | 7375 | 7070 | 6f72 | 7465 | 6420 | 6f6e | 2073 | 6f63 | 6b65 | 7400 | 28c4 | 001c |
| 1151560 | 000c | bc48 | 4e1c | 0000 | 0000 | 016b | 5230 | 0000 | 0000 | 4327 | 0000 | 432f | 000c | 4550 | 464e | 4f53 | 5550 | 504f | 5254 | 002b | 001d | 5072 | 6f74 | 6f63 |
| 1151640 | 6f6c | 2066 | 616d | 696c | 7920 | 6e6f | 7420 | 7375 | 7070 | 6f72 | 7465 | 6400 | 28c4 | 001c | 000c | bc74 | 4e1c | 0000 | 0000 | 0173 | 5230 | 0000 | 0000 | 4337 |
| 1151720 | 0000 | 433f | 000c | 4541 | 464e | 4f53 | 5550 | 504f | 5254 | 0076 | 28c4 | 001c | 000c | bcbc | 4e1c | 0000 | 0000 | 017b | 5230 | 0000 | 0000 | 4347 | 0000 | 434f |
| 1152000 | 000a | 4541 | 4444 | 5249 | 4e55 | 5345 | 0000 | 033b | 0016 | 4164 | 6472 | 6573 | 7320 | 616c | 7265 | 6164 | 7920 | 696e | 2075 | 7365 | 000c | bcbe | 28c4 | 001c |
| 1152060 | 000c | bd0c | 4e1c | 0000 | 0000 | 0183 | 5230 | 0000 | 0000 | 4357 | 0000 | 435f | 000d | 4541 | 4444 | 524e | 4f54 | 4156 | 4149 | 4c00 | 001e | 4361 | 6e27 | 7420 |
| 1152140 | 6173 | 7369 | 676e | 2072 | 6571 | 7565 | 7374 | 6564 | 2061 | 6464 | 7265 | 7373 | 000c | bd0e | 28c4 | 001c | 000c | bd48 | 4e1c | 0000 | 0000 | 018b | 5230 | 0000 |
| 1152220 | 0000 | 4367 | 0000 | 436f | 0008 | 454e | 4554 | 444f | 574e | 0007 | 000f | 4e65 | 7477 | 6f72 | 6b20 | 6973 | 2064 | 6f77 | 6e00 | 0313 | 28c4 | 001c | 000c | bd90 |
| 1152300 | 4e1c | 0000 | 0000 | 0193 | 5230 | 0000 | 0000 | 4377 | 0000 | 437f | 000b | 454e | 4554 | 554e | 5245 | 4143 | 4800 | bd76 | 0016 | 4e65 | 7477 | 6f72 | 6b20 | 6973 |
| 1152360 | 2075 | 6e72 | 6561 | 6368 | 6162 | 6c65 | 0000 | 033b | 28c4 | 001c | 000c | bde0 | 4e1c | 0000 | 0000 | 019b | 5230 | 0000 | 0000 | 4387 | 0000 | 438f | 0009 | 454e |
| 1152440 | 4554 | 5245 | 5345 | 5400 | 0023 | 4e65 | 7477 | 6f72 | 6b20 | 6472 | 6f70 | 7065 | 6420 | 636f | 6e6e | 6563 | 7469 | 6f6e | 206f | 6e20 | 7265 | 7365 | 7400 | 0383 |
| 1152520 | 28c4 | 001c | 000c | be30 | 4e1c | 0000 | 0000 | 01a3 | 5230 | 0000 | 0000 | 4397 | 0000 | 439f | 000c | 4543 | 4f4e | 4e41 | 424f | 5254 | 4544 | 000e | 0020 | 536f |
| 1152600 | 6674 | 7761 | 7265 | 2063 | 6175 | 7365 | 6420 | 636f | 6e6e | 6563 | 7469 | 6f6e | 2061 | 626f | 7274 | 0077 | 28c4 | 001c | 000c | be78 | 4e1c | 0000 | 0000 | 01ab |
| 1152660 | 5230 | 0000 | 0000 | 43a7 | 0000 | 43af | 000a | 4543 | 4f4e | 4e52 | 4553 | 4554 | 000c | be5e | 0018 | 436f | 6e6e | 6563 | 7469 | 6f6e | 2072 | 6573 | 6574 | 2062 |
| 1152740 | 7920 | 7065 | 6572 | 008b | 28c4 | 001c | 000c | bebc | 4e1c | 0000 | 0000 | 01b3 | 5230 | 0000 | 0000 | 43b7 | 0000 | 43bf | 0007 | 454e | 4f42 | 5546 | 5300 | 0193 |
| 1153020 | 0019 | 4e6f | 2062 | 7566 | 6665 | 7220 | 7370 | 6163 | 6520 | 6176 | 6169 | 6c61 | 626c | 6500 | 28c4 | 001c | 000c | bf04 | 4e1c | 0000 | 0000 | 01bb | 5230 | 0000 |
| 1153100 | 0000 | 43c7 | 0000 | 43cf | 0007 | 4549 | 5343 | 4f4e | 4e00 | bee6 | 001b | 536f | 636b | 6574 | 2069 | 7320 | 616c | 7265 | 6164 | 7920 | 636f | 6e6e | 6563 | 7465 |
| 1153160 | 6400 | bf06 | 28c4 | 001c | 000c | bf48 | 4e1c | 0000 | 0000 | 01c3 | 5230 | 0000 | 0000 | 43d7 | 0000 | 43df | 0008 | 454e | 4f54 | 434f | 4e4e | 002e | 0017 | 536f |
| 1153240 | 636b | 6574 | 2069 | 7320 | 6e6f | 7420 | 636f | 6e6e | 6563 | 7465 | 6400 | 0363 | 28c4 | 001c | 000c | bf94 | 4e1c | 0000 | 0000 | 01cb | 5230 | 0000 | 0000 | 43e7 |
| 1153320 | 0000 | 43ef | 0009 | 4553 | 4855 | 5444 | 4f57 | 4e00 | 0020 | 4361 | 6e27 | 7420 | 7365 | 6e64 | 2061 | 6674 | 6572 | 2073 | 6f63 | 6b65 | 7420 | 7368 | 7574 | 646f |
| 1153400 | 776e | 0096 | 28c4 | 001c | 000c | bfe4 | 4e1c | 0000 | 0000 | 01d3 | 5230 | 0000 | 0000 | 43f7 | 0000 | 43ff | 000c | 4554 | 4f4f | 4d41 | 4e59 | 5245 | 4653 | 00cb |
| 1153460 | 0021 | 546f | 6f20 | 6d61 | 6e79 | 2072 | 6566 | 6572 | 656e | 6365 | 733a | 2063 | 616e | 2774 | 2073 | 706c | 6963 | 6500 | 28c4 | 001c | 000c | c024 | 4e1c | 0000 |
| 1153540 | 0000 | 01db | 5230 | 0000 | 0000 | 4407 | 0000 | 440f | 0009 | 4554 | 494d | 4544 | 4f55 | 5400 | 0014 | 436f | 6e6e | 6563 | 7469 | 6f6e | 2074 | 696d | 6564 | 206f |
| 1153620 | 7574 | 0026 | 28c4 | 001c | 000c | c068 | 4e1c | 0000 | 0000 | 01e3 | 5230 | 0000 | 0000 | 4417 | 0000 | 441f | 000c | 4543 | 4f4e | 4e52 | 4546 | 5553 | 4544 | 006b |
| 1153700 | 0012 | 436f | 6e6e | 6563 | 7469 | 6f6e | 2072 | 6566 | 7573 | 6564 | 0000 | 037b | 28c4 | 001c | 000c | c0b0 | 4e1c | 0000 | 0000 | 01eb | 5230 | 0000 | 0000 | 4427 |
| 1153760 | 0000 | 442f | 0005 | 454c | 4f4f | 5000 | 0021 | 546f | 6f20 | 6d61 | 6e79 | 206c | 6576 | 656c | 7320 | 6f66 | 2073 | 796d | 626f | 6c69 | 6320 | 6c69 | 6e6b | 7300 |
| 1154040 | 28c4 | 001c | 000c | c0f4 | 4e1c | 0000 | 0000 | 01f3 | 5230 | 0000 | 0000 | 4437 | 0000 | 443f | 000c | 454e | 414d | 4554 | 4f4f | 4c4f | 4e47 | 0007 | 0012 | 4669 |
| 1154120 | 6c65 | 206e | 616d | 6520 | 746f | 6f20 | 6c6f | 6e67 | 000c | c0f6 | 28c4 | 001c | 000c | c12c | 4e1c | 0000 | 0000 | 01fb | 5230 | 0000 | 0000 | 4447 | 0000 | 444f |
| 1154200 | 0009 | 4548 | 4f53 | 5444 | 4f57 | 4e00 | 000c | 486f | 7374 | 2069 | 7320 | 646f | 776e | 002e | 28c4 | 001c | 000c | c16c | 4e1c | 0000 | 0000 | 0203 | 5230 | 0000 |
| 1154260 | 0000 | 4457 | 0000 | 445f | 000c | 4548 | 4f53 | 5455 | 4e52 | 4541 | 4348 | 00ab | 0010 | 4e6f | 2072 | 6f75 | 7465 | 2074 | 6f20 | 686f | 7374 | 006e | 28c4 | 001c |
| 1154340 | 000c | c1ac | 4e1c | 0000 | 0000 | 020b | 5230 | 0000 | 0000 | 4467 | 0000 | 446f | 0009 | 454e | 4f54 | 454d | 5054 | 5900 | 0013 | 4469 | 7265 | 6374 | 6f72 | 7920 |
| 1154420 | 6e6f | 7420 | 656d | 7074 | 7900 | c1ae | 28c4 | 001c | 000c | c1ec | 4e1c | 0000 | 0000 | 0213 | 5230 | 0000 | 0000 | 4477 | 0000 | 447f | 0008 | 4550 | 524f | 434c |
| 1154500 | 494d | 00d6 | 0012 | 546f | 6f20 | 6d61 | 6e79 | 2070 | 726f | 6365 | 7373 | 6573 | 000c | c1ee | 28c4 | 001c | 000c | c228 | 4e1c | 0000 | 0000 | 021b | 5230 | 0000 |
| 1154560 | 0000 | 4487 | 0000 | 448f | 0006 | 4555 | 5345 | 5253 | 000c | c216 | 000e | 546f | 6f20 | 6d61 | 6e79 | 2075 | 7365 | 7273 | 0000 | 039b | 28c4 | 001c | 000c | c268 |
| 1154640 | 4e1c | 0000 | 0000 | 0223 | 5230 | 0000 | 0000 | 4497 | 0000 | 449f | 0006 | 4544 | 5155 | 4f54 | 0000 | 032b | 0013 | 4469 | 7363 | 2071 | 756f | 7461 | 2065 | 7863 |
| 1154720 | 6565 | 6465 | 6400 | 031b | 28c4 | 001c | 000c | c2a8 | 4e1c | 0000 | 0000 | 022b | 5230 | 0000 | 0000 | 44a7 | 0000 | 44af | 0006 | 4553 | 5441 | 4c45 | 0000 | 034b |
| 1155000 | 0015 | 5374 | 616c | 6520 | 4e46 | 5320 | 6669 | 6c65 | 2068 | 616e | 646c | 6500 | 28c4 | 001c | 000c | c2f4 | 4e1c | 0000 | 0000 | 0233 | 5230 | 0000 | 0000 | 44b7 |
| 1155060 | 0000 | 44bf | 0007 | 4552 | 454d | 4f54 | 4500 | 0313 | 0021 | 546f | 6f20 | 6d61 | 6e79 | 206c | 6576 | 656c | 7320 | 6f66 | 2072 | 656d | 6f74 | 6520 | 696e | 2070 |
| 1155140 | 6174 | 6800 | 28c4 | 001c | 000c | c338 | 4e1c | 0000 | 0000 | 023b | 5230 | 0000 | 0000 | 44c7 | 0000 | 44cf | 0006 | 454e | 4f53 | 5452 | 000c | c31e | 0016 | 4465 |
| 1155220 | 7669 | 6365 | 2069 | 7320 | 6e6f | 7420 | 6120 | 7374 | 7265 | 616d | 0000 | 0383 | 28c4 | 001c | 000c | c36c | 4e1c | 0000 | 0000 | 0243 | 5230 | 0000 | 0000 | 44d7 |
| 1155300 | 0000 | 44df | 0005 | 4554 | 494d | 4500 | 000d | 5469 | 6d65 | 7220 | 6578 | 7069 | 7265 | 6400 | 28c4 | 001c | 000c | c3ac | 4e1c | 0000 | 0000 | 024b | 5230 | 0000 |
| 1155360 | 0000 | 44e7 | 0000 | 44ef | 0005 | 454e | 4f53 | 5200 | 0018 | 4f75 | 7420 | 6f66 | 2073 | 7472 | 6561 | 6d73 | 2072 | 6573 | 6f75 | 7263 | 6573 | 009e | 28c4 | 001c |
| 1155440 | 000c | c3f4 | 4e1c | 0000 | 0000 | 0253 | 5230 | 0000 | 0000 | 44f7 | 0000 | 44ff | 0006 | 454e | 4f4d | 5347 | 000c | c3c6 | 001a | 4e6f | 206d | 6573 | 7361 | 6765 |
| 1155520 | 206f | 6620 | 6465 | 7369 | 7265 | 6420 | 7479 | 7065 | 000c | c3e6 | 28c4 | 001c | 000c | c440 | 4e1c | 0000 | 0000 | 025b | 5230 | 0000 | 0000 | 4507 | 0000 | 450f |
| 1155600 | 0007 | 4542 | 4144 | 4453 | 4700 | c40e | 0021 | 5472 | 7969 | 6e67 | 2074 | 6f20 | 7265 | 6164 | 2075 | 6e72 | 6561 | 6461 | 626c | 6520 | 6d65 | 7373 | 6167 | 6500 |
| 1155660 | 28c4 | 001c | 000c | c47c | 4e1c | 0000 | 0000 | 0263 | 5230 | 0000 | 0000 | 4517 | 0000 | 451f | 0005 | 4549 | 4452 | 4d00 | 0012 | 4964 | 656e | 7469 | 6669 | 6572 |
| 1155740 | 2072 | 656d | 6f76 | 6564 | 000c | c46e | 28c4 | 001c | 000c | c4bc | 4e1c | 0000 | 0000 | 026b | 5230 | 0000 | 0000 | 4527 | 0000 | 452f | 0007 | 4544 | 4541 | 444c |
| 1156020 | 4b00 | c496 | 0012 | 4465 | 6164 | 6c6f | 636b | 2063 | 6f6e | 6469 | 7469 | 6f6e | 000c | c4ae | 28c4 | 001c | 000c | c500 | 4e1c | 0000 | 0000 | 0273 | 5230 | 0000 |
| 1156100 | 0000 | 4537 | 0000 | 453f | 0006 | 454e | 4f4c | 434b | 000c | c4d6 | 0019 | 4e6f | 2072 | 6563 | 6f72 | 6420 | 6c6f | 636b | 7320 | 6176 | 6169 | 6c61 | 626c | 6500 |
| 1156160 | 28c4 | 001c | 000c | c548 | 4e1c | 0000 | 0000 | 027b | 5230 | 0000 | 0000 | 4547 | 0000 | 454f | 0006 | 454e | 4f4e | 4554 | 0000 | 037b | 001d | 4d61 | 6368 | 696e |
| 1156240 | 6520 | 6973 | 206e | 6f74 | 206f | 6e20 | 7468 | 6520 | 6e65 | 7477 | 6f72 | 6b00 | 28c4 | 001c | 000c | c584 | 4e1c | 0000 | 0000 | 0283 | 5230 | 0000 | 0000 | 4557 |
| 1156320 | 0000 | 455f | 0008 | 4552 | 5245 | 4d4f | 5445 | 00ab | 0010 | 4f62 | 6a65 | 6374 | 2069 | 7320 | 7265 | 6d6f | 7465 | 0086 | 28c4 | 001c | 000c | c5c8 | 4e1c | 0000 |

```
1156400 0000 028b 5230 0000 0000 4567 0000 456f 0007 454e 4f4c 494e 4b00 c5ae 0019 7468 6520 6c69 6e6b 2068 6173 2062 6565 6e20
1156460 7365 7665 7265 6400 28c4 001c 000c c600 4e1c 0000 0000 0293 5230 0000 0000 4577 0000 457f 0004 4541 4456 00ee 000f 6164
1156540 7665 7274 6973 6520 6572 726f 7200 034b 28c4 001c 000c c638 4e1c 0000 0000 029b 5230 0000 0000 4587 0000 458f 0006 4553
1156620 524d 4e54 0000 017b 000d 7372 6d6f 756e 7420 6572 726f 7200 28c4 001c 000c c67c 4e1c 0000 0000 02a3 5230 0000 0000 4597
1156700 0000 459f 0005 4543 4f4d 4d00 001b 436f 6d6d 756e 6963 6174 696f 6e20 6572 726f 7220 6f6e 2073 656e 6400 c67e 28c4 001c
1156760 000c c6b8 4e1c 0000 0000 02ab 5230 0000 0000 45a7 0000 45af 0006 4550 524f 544f 000c d3d6 000e 5072 6f74 6f63 6f6c 2065
1157040 7272 6f72 000c c741 28c4 001c 000c c6f8 4e1c 0000 0000 02b3 5230 0000 0000 45b7 0000 45bf 0009 454d 554c 5449 484f 5000
1157120 0012 6d75 6c74 6968 6f70 2061 7474 656d 7074 6564 0000 24ff 28c4 001c 000c c744 4e1c 0000 0000 02bb 5230 0000 0000 45c7
1157200 0000 45cf 0007 4544 4f54 444f 5400 17e3 0020 4372 6f73 7320 6d6f 756e 7420 706f 696e 7420 286e 6f74 2061 6e20 6572 726f
1157260 7229 00af 28c4 001c 000c c788 4e1c 0000 0000 02c3 5230 0000 0000 45d7 0000 45df 0007 4552 454d 4348 4700 17e3 0016 5265
1157340 6d6f 7465 2061 6464 7265 7373 2063 6861 6e67 6564 000c c775 28c4 001c 000c c7cc 4e1c 0000 0000 02cb 5230 0000 0000 45e7
1157420 0000 45ef 0006 4555 4e49 4d50 000c c741 0019 4f70 6572 6174 696f 6e20 6e6f 7420 696d 706c 656d 656e 7465 6400 28c4 001c
1157500 000c c814 4e1c 0000 0000 1f23 5230 0000 0000 45f7 0000 45ff 0008 454e 4f54 4152 4348 0007 001b 4172 6368 6976 6520 6e6f
1157560 7420 696e 2061 7228 3529 2066 6f72 6d61 7400 c816 28c4 001c 000c c85c 4e1c 0000 0000 1f2b 5230 0000 0000 4607 0000 460f
1157640 0008 454e 4f54 4d45 4d42 003e 001d 4d65 6d62 6572 206e 6f74 2070 7265 7365 6e74 2069 6e20 6172 6368 6976 6500 28c4 001c
1157720 000c c8ac 4e1c 0000 0000 1f33 5230 0000 0000 4617 0000 461f 0007 4555 4e4b 5641 5200 c886 0024 2476 6172 6961 626c 6520
1160000 6e6f 7420 6465 6669 6e65 6420 696e 2065 6e76 6972 6f6e 6d65 6e74 00ae 28c4 001c 000c c8f0 4e1c 0000 0000 1f3b 5230 0000
1160060 0000 4627 0000 462f 0007 4556 4d53 4552 5200 c8d6 0019 556e 7472 616e 736c 6174 6561 626c 6520 564d 5320 6572 726f 7200
1160140 2954 001c 0002 438a 4e1c 0000 0007 fffb 5230 0000 0000 4637 0000 463f 0007 5164 656c 6574 6500 44ec 2938 0014 000c c938
1160220 4e1c 0000 0000 0ad7 3050 c5a8 0008 6572 726e 6f2e 706c 0064 28c4 0014 000c eb68 4e1c 0000 0000 0007 4960 2edc 0005 5150
1160300 5f4c 3100 000b ae34 0000 0000 000c ae8c 000c c954 000c caa4 0000 0058 b288 b66c 0000 02e0 7fff ffff 000d 1864 0200 0db5
1160360 0100 15ad 0100 33fd 0000 000b 0000 315f 000c caa4 0000 002c b288 b66c 0000 02e0 7fff ffff 000c c96c 0200 0db5 0100 15ad
1160440 0100 33fd 0000 000b 0000 315f 003f 2f68 6f6d 652f 6f73 6173 322f 622f 7175 696e 7475 732f 6765 6e65 7269 632f 7170 6c69
1160520 6232 2e35 2f6c 6962 7261 7279 2f73 756e 342d 342e 302f 6669 6c65 732e 6f00 6272 003d 2f68 6f6d 652f 6f73 6173 322f 622f
1160600 7175 696e 7475 732f 6765 6e65 7269 632f 7170 6c69 6232 2e35 2f6c 6962 7261 7279 2f73 756e 342d 342f 6669 6c65 732e 6f00
1160660 0000 002c 000c 6b14 b27c b66c 0000 02eb 7fff ffff 000c a568 0200 0db5 0200 224d 0000 3e7f 0000 3e1f 0000 315f 000a 3dc8
1160740 0000 0000 0000 002c 000c 8e64 b27c b66c 0000 02ec 7fff ffff 000c 6b54 0200 0db5 0200 24bd 0000 3287 0000 3e1f 0000 315f
1161020 000c ef88 0000 1ecc 6669 6e65 2061 6e79 2050 726f 6c6f 6720 7072 6564 6963 6174 6573 2c20 6275 7420 6a75 7374 206c 6f61
1161100 6473 2065 6163 6365 7373 2e6f 2e0a 2a2f 0a0a 666f 7265 6967 6e5f 6669 6c65 2873 7973 7465 6d28 2765 6163 6365 7373 2e6f
1161160 2729 2c20 5b5d 292e 0a0a 3a2d 206c 6f61 645f 666f 7265 6967 6e5f 6669 6c65 7328 5b73 7973 7465 6d28 2765 6163 6365 7373
1161240 2e6f 2729 5d2c 205b 5d29 2c0a 2020 2061 626f 6c69 7368 2866 6f72 6569 676e 5f66 696c 652c 2032 292e 0a0a 726d 2909 092d
1161320 2d20 5c2b 2063 6f6d 706f 756e 6428 5465 726d 290a 0a09 7379 6d62 6f6c 2854 6572 6d29 0909 2d2d 2061 746f 6d28 5465 726d
1161400 290a 0963 6f6e 7374 616e 7428 5465 726d 2909 092d 2d20 6174 6f6d 6963 2854 6572 6d29 0a09 7072 6f70 6572 5f6c 6973 7428
1161460 5465 726d 2909 2d2d 206c 6973 7420 616e 6420 616c 7265 6164 7920 656e 6473 2077 6974 6820 6e69 6c0a 0963 6861 7273 2854
1161540 6572 6d29 0909 2d2d 2070 726f 7065 7220 6c69 7374 206f 6620 6368 6172 6163 7465 7220 636f 6465 730a 0a20 2020 204d 6f73
1161620 7420 6f66 2074 6865 2061 626f 7665 2074 6573 7473 2063 6f6d 6520 6672 6f6d 2052 2e20 412e 204f 274b 6565 6665 2773 2022
1161700 4472 6166 7420 5072 6f70 6f73 6564 0a20 2020 2053 7461 6e64 6172 6420 666f 7220 5072 6f6c 6f67 2045 7661 6c75 6162 6c65
1161760 2050 7265 6469 6361 7465 7322 2c20 6275 7420 7072 6f70 6572 5f6c 6973 742f 3120 616e 640a 2020 2020 6368 6172 732f 3120
1162040 6172 6520 6e65 772e 2020 5468 6973 2066 696c 6520 616c 736f 2069 6e63 6c75 6465 7320 7468 6520 6368 6563 6b73 0a0a 096d
1162120 7573 745f 6265 5f69 6e74 6567 6572 2858 2c09 4e2c 2047 6f61 6c29 0a09 6d75 7374 5f62 655f 6e75 6d62 6572 2858 2c09 4e2c
1162200 2047 6f61 6c29 0a09 6d75 7374 5f62 655f 6174 6f6d 2858 2c09 094e 2c20 476f 616c 290a 096d 7573 745f 6265 5f73 796d 626f
1162260 6c28 582c 094e 2c20 476f 616c 290a 096d 7573 745f 6265 5f63 6f6e 7374 616e 7428 582c 094e 2c20 476f 616c 290a 096d 7573
1162340 745f 6265 5f63 616c 6c61 626c 6528 582c 094e 2c20 476f 616c 290a 096d 7573 745f 6265 5f6e 6f6e 7661 7228 582c 094e 2c20
1162420 476f 616c 290a 096d 7573 745f 6265 5f76 6172 2858 2c09 094e 2c20 476f 616c 290a 096d 7573 745f 6265 5f67 726f 756e 6428
1162500 582c 094e 2c20 476f 616c 290a 096d 7573 745f 6265 5f6f 6e65 6f66 2858 2c20 4c2c 094e 2c20 476f 616c 290a 096d 7573 745f
1162560 6265 5f6e 6f6e 6e65 6728 582c 094e 2c20 476f 616c 290a 096d 7573 745f 6265 5f70 726f 7065 725f 6c69 7374 2858 2c20 204e
1162640 2c20 476f 616c 290a 096d 7573 745f 6265 5f63 6861 7273 2858 2c09 4e2c 2047 6f61 6c29 0a09 6d75 7374 5f62 655f 6265 7477
1162720 6565 6e28 582c 204c 2c55 2c09 4e2c 2047 6f61 6c29 0a0a 2020 2020 7768 6963 6820 6368 6563 6b20 666f 7220 6120 636f 6e64
1163000 6974 696f 6e20 61be 6420 7265 706f 7274 2061 2075 7365 6675 6c20 6d65 7373 6167 6520 6966 2074 6865 0a20 2020 2061 7267
1163060 756d 656e 7420 6861 7320 7468 6520 7772 6f6e 6720 7479 7065 2e20 2054 6865 2069 6465 6120 6973 2074 6861 7420 6172 6728
1163140 4e2c 476f 616c 2c58 2920 6973 0a20 2020 2073 7570 706f 7365 6420 746f 2062 6520 7472 7565 2e0a 0a09 2a2a 2a20 5468 6973
1163220 2066 696c 6520 6973 2075 6e73 7570 706f 7274 6564 2069 6e20 7468 6520 7365 6e73 6520 7468 6174 2069 7420 6973 206d 6561
1163300 6e74 0a09 2a2a 2a20 666f 7220 7573 6520 6f6e 6c79 2062 7920 5175 696e 7475 732e 2020 5468 6520 6661 6374 2074 6861 7420
1163360 6c69 6272 6172 7920 6669 6c65 730a 092a 2a2a 2077 6869 6368 2075 7365 2074 6869 7320 6669 6c65 2067 656e 6572 6174 6520
1163440 6572 726f 7220 7265 706f 7274 7320 7769 6c6c 206e 6f74 2062 650a 092a 2a2a 2063 6861 6e67 6564 2c20 6275 7420 7468 6520
```

```
1163520 6d61 6e6e 6572 2069 6e20 7768 6963 6820 6572 726f 7273 2061 7265 2064 6574 6563 7465 6420 260a 092a 2a2a 2072 6570 6f72
1163600 7465 6420 6973 206c 696b 656c 7920 746f 2063 6861 6e67 6520 4452 414d 4154 4943 414c 4c59 2062 6566 6f72 6520 6c6f 6e67
1163660 2e0a 092a 2a2a 2046 6565 6c20 6672 6565 2074 6f20 7573 6520 7468 6973 2073 7475 6666 2c20 6275 7420 6265 2070 7265 7061
1163740 7265 6420 666f 7220 6974 2074 6f0a 092a 2a2a 2062 6520 7265 706c 6163 6564 2062 7920 736f 6d65 7468 696e 6720 6d75 6368
1164020 2062 6574 7465 7221 0a0a 2020 2020 5468 6520 6368 6563 6b73 2064 7573 745f 6265 5f78 7878 2061 7265 206e 6f74 206d 6561
1164100 6e74 2066 6f72 2059 4f55 5220 7573 652c 2062 7574 2066 6f72 204f 5552 532e 0a20 2020 204f 7468 6572 206c 6962 7261 7279
1164160 2066 696c 6573 2075 7365 2074 6865 6d20 746f 2064 6f20 6572 726f 7220 6368 6563 6b69 6e67 2e20 2059 6f75 2073 686f 756c
1164240 646e 2774 0a20 2020 2072 656c 7920 6f6e 2074 6865 6d2c 2062 6563 6175 7365 2069 6e20 7468 6520 6e65 7874 2072 656c 6561
1164320 7365 206f 6620 7468 6520 6c69 6272 6172 792c 2065 7272 6f72 0a20 2020 2063 6865 636b 696e 6720 6d61 7920 6265 2064 6f6e
1164400 6520 696e 2061 2063 6f6d 706c 6574 656c 7920 6469 6666 6572 656e 7420 7761 792e 2020 5468 6520 6d61 696e 2072 6561 736f
1164460 6e0a 2020 2020 666f 7220 6861 7669 6e67 2074 6869 7320 6669 6c65 2c20 6170 6172 7420 6672 6f6d 2064 6566 696e 696e 6720
1164540 6120 636f 6c6c 6563 7469 6f6e 206f 6620 7479 7065 2074 6573 7473 0a20 2020 2077 6869 6368 2061 7265 2075 7365 6675 6c20
1164620 696e 2074 6865 6972 206f 776e 2072 6967 6874 2c20 6973 2074 6f20 7072 6f76 6964 6520 6120 7365 7420 6f66 2063 6865 636b
1164700 730a 2020 2020 7468 6174 2049 2063 616e 2070 7574 2069 6e74 6f20 6d79 2063 6f64 6520 736f 2074 6861 7420 4920 646f 2073
1164760 6f6d 6574 6869 6e67 2073 656e 7369 626c 6520 696e 2074 6865 0a20 2020 2065 7665 6e74 206f 6620 616e 2065 7272 6f72 2c20
1165040 736f 2074 6861 7420 7768 656e 2073 6f6d 6574 6869 6e67 2062 6574 7465 7220 6973 2064 6573 6967 6e65 6420 4920 7769 6c6c
1165120 0a20 2020 2068 6176 6520 6578 6973 7469 6e67 2063 6f64 6520 746f 2075 7064 6174 6520 7261 7468 6572 2074 6861 6e20 6861
1165200 7669 6e67 2074 6f20 676f 2074 6872 6f75 6768 2061 6e64 0a20 2020 2069 6e73 7461 6c6c 2063 6f6d 706c 6574 656c 7920 6e65
1165260 7720 636f 6465 2e0a 0a20 2020 204e 6f74 6520 7468 6174 2061 6c74 686f 7567 6820 6f6e 6520 6f66 2074 6865 2061 7267 756d
1165340 656e 7473 206f 6620 7468 6573 6520 726f 7574 696e 6573 2069 730a 2020 2020 6465 7363 7269 6265 6420 6173 2061 2022 676f
1165420 616c 222c 2077 6520 6172 6520 4e4f 5420 676f 696e 6720 746f 2063 616c 6c20 6974 2c20 616e 6420 6974 2077 6f75 6c64 0a20
1165500 2020 206f 6e6c 7920 6d61 6b65 2074 6869 6e67 7320 6d6f 7265 206f 6273 6375 7265 2074 6f20 6465 636c 6172 6520 7468 6573
1165560 6520 7072 6564 6963 6174 6573 2061 730a 2020 2020 6d65 7461 5f70 7265 6469 6361 7465 732e 2020 5765 2061 7265 206a 7573
1165640 7420 676f 696e 6720 746f 2070 7269 6e74 2074 686f 7365 2022 676f 616c 7322 2e0a 2a2f 0a0a 3a2d 206d 6f64 756c 6528 7479
1165720 7065 732c 205b 0a09 6361 6c6c 6162 6c65 2f31 2c0a 0963 6861 7273 2f31 2c0a 2020 2020 2f2a 0963 6f6d 706c 6578 2f31 2c09
1166000 0909 2520 666f 7220 7468 6520 6675 7475 7265 092a 2f0a 0963 6f6d 706f 756e 642f 312c 0a09 636f 6e73 7461 6e74 2f31 2c0a
1166060 0967 726f 756e 642f 312c 0a09 7072 6f70 6572 5f6c 6973 742f 312c 0a20 2020 202f 2a09 7261 7469 6f6e 616c 2f31 2c09 0909
1166140 2520 666f 7220 7468 6520 6675 7475 7265 092a 2f0a 0973 696d 706c 652f 312c 0a20 2020 202f 2a09 7374 7269 6e67 2f31 2c09
1166220 0909 2520 666f 7220 7468 6520 6675 7475 7265 092a 2f0a 0973 796d 626f 6c2f 312c 0a09 7465 726d 5f74 7970 652f 322c 0a09
1166300 6d75 7374 5f62 652f 332c 0a09 6d75 7374 5f62 652f 342c 0a09 7368 6f75 6c64 5f62 652f 332c 0a09 7368 6f75 6c64 5f62 652f
1166360 342c 0a20 2020 202f 2a09 0909 5448 4520 5245 5354 2041 5245 204f 4253 4f4c 4553 4345 4e54 0909 2a2f 0a09 6d75 7374 5f62
1166440 655f 6174 6f6d 2f33 2c0a 096d 7573 745f 6265 5f62 6574 7765 656e 2f35 2c0a 096d 7573 745f 6265 5f63 616c 6c61 626c 652f
1166520 332c 0a09 6d75 7374 5f62 655f 6368 6172 732f 332c 0a09 6d75 7374 5f62 655f 636f 6d70 6f75 6e64 2f33 2c0a 096d 7573 745f
1166600 6265 5f63 6f6e 7374 616e 742f 332c 0a09 6d75 7374 5f62 655f 6772 6f75 6e64 2f33 2c0a 096d 7573 745f 6265 5f69 6e74 6567
1166660 6572 2f33 2c0a 096d 7573 745f 6265 5f6e 6f6e 6e65 672f 332c 0a09 6d75 7374 5f62 655f 6e6f 6e76 6172 2f33 2c0a 096d 7573
1166740 745f 6265 5f6e 756d 6265 722f 332c 0a09 6d75 7374 5f62 655f 6f6e 656f 662f 342c 0a09 6d75 7374 5f62 655f 7072 6f70 6572
1167020 5f6c 6973 742f 332c 0a09 6d75 7374 5f62 655f 7379 6d62 6f6c 2f33 2c0a 096d 7573 745f 6265 5f76 6172 2f33 0a20 2020 5d29
1167100 2e0a 0a73 6363 735f 6964 2827 2240 2823 2938 392f 3039 2f31 3120 7479 7065 732e 706c 0933 342e 3222 2729 2e0a 0a0a 0a63
1167160 616c 6c61 626c 6528 5465 726d 2920 3a2d 0a09 6e6f 6e76 6172 2854 6572 6d29 2c0a 0966 756e 6374 6f72 2854 6572 6d2c 2053
1167240 796d 626f 6c2c 205f 4172 6974 7929 2c0a 0961 746f 6d28 5379 6d62 6f6c 292e 0a0a 0a63 6f6d 706f 756e 6428 5465 726d 2920
1167320 3a2d 0a09 6e6f 6e76 6172 2854 6572 6d29 2c0a 0966 756e 6374 6f72 2854 6572 6d2c 205f 5379 6d62 6f6c 2c20 4172 6974 7929
1167400 2c0a 0941 7269 7479 203e 2030 2e0a 0a0a 636f 6e73 7461 6e74 2854 6572 6d29 203a 2d09 0909 2520 5072 6f62 6162 6c79 2074
1167460 6865 2073 616d 6520 6173 2061 746f 6d69 6328 5465 726d 292c 0a09 6e6f 6e76 6172 2854 6572 6d29 2c09 0909 2520 6275 7420
1167540 4927 6d20 706c 6179 696e 6720 7361 6665 2068 6572 652e 0a09 6675 6e63 746f 7228 5465 726d 2c20 5465 726d 2c20 3029 2e09
1167620 0925 2061 746f 6d69 6320 7761 7320 6465 6669 6e65 6420 6173 2069 6e74 6567 6572 7c61 746f 6d0a 0a0a 6772 6f75 6e64 2854
1167700 6572 6d29 203a 2d0a 096e 6f6e 7661 7228 5465 726d 292c 0a09 6675 6e63 746f 7228 5465 726d 2c20 5f2c 2041 7269 7479 292c
1167760 0a09 6772 6f75 6e64 2841 7269 7479 2c20 5465 726d 292e 0a0a 6772 6f75 6e64 284e 2c20 5465 726d 2920 3a2d 0a20 2020 2028
1170040 094e 203d 3a3d 2030 202d 3e20 7472 7565 0a20 2020 203b 0961 7267 284e 2c20 5465 726d 2c20 4172 6729 2c0a 096e 6f6e 7661
1170120 7228 4172 6729 2c0a 0966 756e 6374 6f72 2841 7267 2c20 5f2c 2041 7269 7479 292c 0a09 6772 6f75 6e64 2841 7269 7479 2c20
1170200 4172 6729 2c0a 094d 2069 7320 4e2d 312c 0a09 6772 6f75 6e64 284d 2c20 5465 726d 290a 2020 2020 292e 0a0a 0a70 726f 7065
1170260 725f 6c69 7374 282a 2920 3a2d 2021 2c20 6661 696c 2e09 0925 2063 6174 6368 6573 2076 6172 6961 626c 6573 0a70 726f 7065
1170340 725f 6c69 7374 285b 5d29 2e0a 7072 6f70 6572 5f6c 6973 7428 5b5f 7c4c 5d29 203a 2d0a 0970 726f 7065 725f 6c69 7374 284c
1170420 292e 0a0a 0a73 696d 706c 6528 5465 726d 2920 3a2d 0a20 2020 2028 0976 6172 2854 6572 6d29 202d 3e20 7472 7565 0a20 2020
1170500 203b 0966 756e 6374 6f72 2854 6572 6d2c 2054 6572 6d2c 2030 290a 2020 2020 292e 0a0a 0a73 796d 626f 6c28 5465 726d 2920
1170560 3a2d 0a09 6174 6f6d 2854 6572 6d29 2e0a 0a0a 2520 2020 7465 726d 5f74 7970 6528 2b54 6572 6d2c 203f 5479 7065 290a 2520
```

1170640 2020 6973 2061 2074 7970 6520 7465 7374 696e 6720 7072 6564 6963 6174 6520 6465 7369 676e 6564 2066 6f72 2069 6e63 6f72
1170720 706f 7261 7469 6f6e 2069 6e74 6f20 636f 726f 7574 696e 696e 670a 2520 2020 5072 6f6c 6f67 7320 6c69 6b65 204d 5520 5072
1171000 6f6c 6f67 2061 6e64 204e 5520 5072 6f6c 6f67 2e20 2049 6e20 6765 6e65 7261 6c2c 2074 6865 2072 756c 6520 6973 2074 6861
1171060 7420 7768 656e 0a25 2020 2061 2070 7265 6469 6361 7465 202a 776f 756c 642a 2064 656c 6179 2069 6e20 6120 636f 726f 7574
1171140 696e 696e 6720 7379 7374 656d 2c20 6974 202a 6d75 7374 2a20 7265 706f 7274 2061 6c0a 2520 2020 696e 7374 616e 7469 6174
1171220 696f 6e20 6661 756c 7420 696e 2061 206e 6f6e 2d63 6f72 6f75 7469 6e69 6e67 2073 7973 7465 6120 6c69 6b65 2051 7569 6e74
1171300 7573 2050 726f 6c6f 672e 0a25 2020 2054 6869 7320 7072 6564 6963 6174 6520 6973 206e 6f20 6578 6365 7074 696f 6e3a 2074
1171360 6865 2054 6572 6120 6d75 7374 2062 6520 696e 7374 616e 7469 6174 6564 2077 6865 6e20 796f 750a 2520 2020 6361 6c6c 2074
1171440 6572 6d5f 7479 7065 2f32 2062 6563 6175 7365 206b 6e6f 7769 6e67 2074 6865 2054 7970 6520 646f 6573 6e27 7420 6769 7665
1171520 2079 6f75 2065 6e6f 7567 680a 2520 2020 696e 666f 726d 6174 696f 6e20 746f 2072 6563 6f6e 7374 7275 6374 2074 6865 2054
1171600 6572 6d2e 2020 4966 2079 6f75 2073 7570 706c 7920 7468 6520 5479 7065 2c20 6173 2069 6e0a 2520 2020 7465 726d 5f74 7970
1171660 6528 582c 2063 6f6e 7374 616e 7429 2c20 7468 6973 2069 7320 6120 7065 7266 6563 746c 7920 676f 6f64 206c 6f67 6963 616c
1171740 2074 6573 742e 2020 4974 2069 730a 2520 2020 6e6f 7420 6173 2066 6173 7420 6173 2061 746f 6d69 6328 5829 2077 6f75 6c64
1172020 2062 652c 2062 7574 2069 7420 6973 2022 736f 756e 6422 2e20 2049 6e20 6f72 6465 7220 746f 0a25 2020 2070 7265 7365 7276
1172100 6520 7468 6520 6c6f 6769 6361 6c20 6368 6172 6163 7465 7220 6f66 2074 6869 7320 7072 6564 6963 6174 652c 2069 6620 796f
1172160 7520 6c65 6176 6520 5479 7065 0a25 2020 2075 6e62 6f75 6e64 2c20 616c 6c20 7468 6520 7479 7065 7320 7768 6963 6820 5465
1172240 726d 2068 6173 2077 696c 6c20 6265 2065 6e75 6d65 7261 7465 642e 0a0a 7465 726d 5f74 7970 6528 5465 726d 2c20 5479 7065
1172320 2920 3a2d 0a09 2820 2020 7661 7228 5465 726d 2920 202d 3e20 696e 7374 616e 7469 6174 696f 6e5f 6661 756c 7428 312c 2074
1172400 6572 6d5f 7479 7065 2854 6572 6d2c 5479 7065 2929 0a09 3b20 2020 6174 6f6d 2854 7970 6529 202d 3e20 7465 726d 5f74 7970
1172460 655f 2854 7970 652c 2054 6572 6d29 0a09 3b20 2020 7661 7228 5479 7065 2920 202d 3e20 7465 726d 5f74 7970 655f 2854 7970
1172540 652c 2054 6572 6d29 0a09 3b20 2020 7368 6f75 6c64 5f62 6528 7379 6d62 6f6c 2c20 5479 7065 2c20 322c 2074 6572 6d5f 7479
1172620 7065 2854 6572 6d2c 5479 7065 2929 0a09 292e 0a0a 0a74 6572 6d5f 7479 7065 5f28 636f 6d70 6f75 6e64 2c20 5465 726d 2920
1172700 3a2d 2063 6f6d 706f 756e 6428 5465 726d 292e 0a74 6572 6d5f 7479 7065 5f28 6361 6c6c 6162 6c65 2c20 5465 726d 2920 3a2d
1172760 2063 616c 6c61 626c 6528 5465 726d 292e 0a74 6572 6d5f 7479 7065 5f28 636f 6e73 7461 6e74 2c20 5465 726d 2920 3a2d 2061
1173040 746f 6d69 6328 5465 726d 292e 0a74 6572 6d5f 7479 7065 5f28 6e75 6d62 6572 2c20 2020 5465 726d 2920 3a2d 206e 756d 6265
1173120 7228 5465 726d 292e 0a74 6572 6d5f 7479 7065 5f28 7379 6d62 6f6c 2c20 2020 5465 726d 2920 3a2d 2061 746f 6d28 5465 726d
1173200 292e 0a25 2020 2020 2020 2020 2028 7374 7269 6e67 2c20 2020 5465 726d 2920 3a2d 2073 7472 696e 6728 5465 726d 292e 0a74
1173260 6572 6d5f 7479 7065 5f28 696e 7465 6765 722c 2020 5465 726d 2920 3a2d 2069 6e74 6567 6572 2854 6572 6d29 2e0a 2520 2020
1173340 2020 2020 2020 2072 6174 696f 6e61 6c2c 2054 6572 6d29 203a 2d20 7261 7469 6f6e 616c 2854 6572 6d29 2e0a 7465 726d 5f74
1173420 7970 655f 2866 6c6f 6174 2c20 2020 2054 6572 6d29 203a 2d20 666c 6f61 7428 5465 726d 292e 0a25 2020 2020 2020 2020 2028
1173500 636f 6d70 6c65 782c 2020 5465 726d 2920 3a2d 2063 6f6d 706c 6578 2854 6572 6d29 2e0a 0a0a 0a25 2020 2063 6861 7273 282b
1173560 5465 726d 290a 2520 2020 6973 2074 7275 6520 7768 656e 2054 6572 6d20 6973 2061 2070 726f 7065 7220 6c69 7374 206f 6620
1173640 4953 4f20 3838 3539 2f31 206f 7220 4542 4344 4943 2063 6861 7261 6374 6572 2063 6f64 6573 2e0a 2520 2020 446f 206e 6f74
1173720 2063 6f6e 6675 7365 2069 7420 7769 7468 2069 735f 6368 6172 732f 3120 696e 206c 6962 7261 7279 2870 7269 6e74 5f63 6861
1174000 7273 292e 2020 416e 7920 7469 6d65 2077 650a 2520 2020 7361 7920 7468 6174 2073 6f6d 6574 6869 6e67 2069 7320 6f72 2073
1174060 686f 756c 6420 6265 2061 2022 6368 6172 7322 2c20 5f74 6869 735f 2069 7320 7768 6174 2077 6520 6d65 616e 2e0a 0a63 6861
1174140 7273 282a 2920 3a2d 2021 2c20 6661 696c 2e0a 6368 6172 7328 5b5d 292e 0a63 6861 7273 285b 4368 6172 7c43 6861 7273 5d29
1174220 203a 2d0a 0969 6e74 6567 6572 2843 6861 7229 2c0a 0943 6861 7220 3e3d 2030 2c20 4368 6172 203d 3c20 3235 352c 0a09 6368
1174300 6172 7328 4368 6172 7329 2e0a 0a0a 252d 2d21 2d2d 2d2d 2d2d 2d2d 2d2d 2d2d 2d2d 2d2d 2d2d 2d2d 2d2d 2d2d 2d2d 2d2d
1174360 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2b0a 2520 2020 5468 6520
1174440 666f 6c6c 6f77 696e 6720 7072 6564 6963 6174 6573 2061 7265 2072 6574 6169 6e65 6420 666f 7220 6261 636b 7761 7264 7320
1174520 636f 6d70 6174 6962 696c 6974 792e 097c 0a25 2020 204e 6f20 6e65 7720 7072 6564 6963 6174 6573 206f 6620 7468 6973 2066
1174600 6f72 6d20 7368 6f75 6c64 2062 6520 7772 6974 7465 6e2c 2061 6e64 2074 6865 7365 206f 6e65 7309 7c0a 2520 2020 7769 6c6c
1174660 2062 6520 7265 6d6f 7665 6420 6672 6f6d 2074 6865 206c 6962 7261 7279 2062 7920 332e 3520 6174 2074 6865 206c 6174 6573
1174740 742e 0909 7c0a 252d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d
1175020 2d2d 2d2d 2d2d 2d2d 2d2d 2d2d 2d2d 2d2d 2d2d 2d2d 2d2d 2d2d 2d2d 2d2d 2d2d 2b0a 0a6d 7573 745f 6265 5f61 746f 6d28 4172
1175100 672c 204e 2c20 476f 616c 2920 3a2d 0a09 6d75 7374 5f62 6528 6174 6f6d 2c20 4172 672c 204e 2c20 476f 616c 292e 0a0a 6d75
1175160 7374 5f62 655f 6265 7477 6565 6e28 4c2c 2055 2c20 4172 672c 204e 2c20 476f 616c 2920 3a2d 0a09 6d75 7374 5f62 6528 6265
1175240 7477 6565 6e28 4c2c 5529 2c20 4172 672c 204e 2c20 476f 616c 292e 0a0a 6d75 7374 5f62 655f 6361 6c6c 6162 6c65 2841 7267
1175320 2c20 4e2c 2047 6f61 6c29 203a 2d0a 096d 7573 745f 6265 2863 616c 6c61 626c 652c 2041 7267 2c20 4e2c 2047 6f61 6c29 2e0a
1175400 0a6d 7573 745f 6265 5f63 6861 7273 2841 7267 2c20 4e2c 2047 6f61 6c29 203a 2d0a 096d 7573 745f 6265 2863 6861 7273 2c20
1175460 4172 672c 204e 2c20 476f 616c 292e 0a0a 6d75 7374 5f62 655f 636f 6d70 6f75 6e64 2841 7267 2c20 4e2c 2047 6f61 6c29 203a
1175540 2d0a 096d 7573 745f 6265 2863 6f6d 706f 756e 642c 2041 7267 2c20 4e2c 2047 6f61 6c29 2e0a 0a6d 7573 745f 6265 5f63 6f6e
1175620 7374 616e 7428 4172 672c 204e 2c20 476f 616c 2920 3a2d 0a09 6d75 7374 5f62 6528 636f 6e73 7461 6e74 2c20 4172 672c 204e
1175700 2c20 476f 616c 292e 0a0a 6d75 7374 5f62 655f 6772 6f75 6e64 2841 7267 2c20 4e2c 2047 6f61 6c29 203a 2d0a 096d 7573 745f

```
1175760 6265 2867 726f 756e 642c 2041 7267 2c20 4e2c 2047 6f61 6c29 2e0a 0a6d 7573 745f 6265 5f69 6e74 6567 6572 2841 7267 2c20
1176040 4e2c 2047 6f61 6c29 203a 2d0a 096d 7573 745f 6265 2869 6e74 6567 6572 2c20 4172 672c 204e 2c20 476f 616c 292e 0a0a 6d75
1176120 7374 5f62 655f 6e6f 6e6e 6567 2841 7267 2c20 4e2c 2047 6f61 6c29 203a 2d0a 096d 7573 745f 6265 286e 6f6e 6e65 672c 2041
1176200 7267 2c20 4e2c 2047 6f61 6c29 2e0a 0a6d 7573 745f 6265 5f6e 6f6e 7661 7228 4172 672c 204e 2c20 476f 616c 2920 3a2d 0a09
1176260 6d75 7374 5f62 6528 6e6f 6e76 6172 2c20 4172 672c 204e 2c20 476f 616c 292e 0a0a 6d75 7374 5f62 655f 6e75 6d62 6572 2841
1176340 7267 2c20 4e2c 2047 6f61 6c29 203a 2d0a 096d 7573 745f 6265 286e 756d 6265 722c 2041 7267 2c20 4e2c 2047 6f61 6c29 2e0a
1176420 0a6d 7573 745f 6265 5f6f 6e65 6f66 2841 7267 2c20 4c69 7374 2c20 4e2c 2047 6f61 6c29 203a 2d0a 096d 7573 745f 6265 286f
1176500 6e65 6f66 284c 6973 7429 2c20 4172 672c 204e 2c20 476f 616c 292e 0a0a 6d75 7374 5f62 655f 7072 6f70 6572 5f6c 6973 7428
1176560 4172 672c 204e 2c20 476f 616c 2920 3a2d 0a09 6d75 7374 5f62 6528 7072 6f70 6572 5f6c 6973 742c 2041 7267 2c20 4e2c 2047
1176640 6f61 6c29 2e0a 0a6d 7573 745f 6265 5f73 796d 626f 6c28 4172 672c 204e 2c20 476f 616c 2920 3a2d 0a09 6d75 7374 5f62 6528
1176720 7379 6d62 6f6c 2c20 4172 672c 204e 2c20 476f 616c 292e 0a0a 6d75 7374 5f62 655f 7661 7228 4172 672c 204e 2c20 476f 616c
1177000 2920 3a2d 0a09 6d75 7374 5f62 6528 7661 722c 2041 7267 2c20 4e2c 2047 6f61 6c29 2e0a 0a0a 0a25 2020 206d 7573 745f 6265
1177060 2854 7970 652c 2054 6572 6d2c 2041 7267 4e6f 2c20 476f 616c 290a 2520 2020 6368 6563 6b73 2077 6865 7468 6572 2074 6865
1177140 2054 6572 6d20 6265 6c6f 6e67 7320 746f 2074 6865 2069 6e64 6963 6174 6564 2054 7970 6520 2879 6f75 2077 696c 6c20 6f66
1177220 7465 6e0a 2520 2020 6361 6c6c 206d 7573 745f 6265 2f32 2077 6865 6e20 796f 7520 6b6e 6f77 2074 6861 7420 7468 6973 2074
1177300 6573 7420 7769 6c6c 2066 6169 6c2c 2062 7574 2079 6f75 2063 616e 0a25 2020 206c 6561 7665 2069 7420 746f 206d 7573 745f
1177360 6265 2f34 2074 6f20 6368 6563 6b20 666f 7220 706f 7529 2e20 2049 6620 6974 2069 736e 2774 2c20 7468 6572 6520 6172 6520
1177440 7477 6f0a 2520 2020 6361 7365 733a 2020 7469 6520 5465 726d 206d 6179 206e 6f74 2062 6520 696e 7374 616e 7469 6174 6564
1177520 2065 6e6f 7567 6820 746f 2074 656c 6c20 7965 742c 2069 6e20 7768 6963 680a 2520 2020 6361 7365 2061 6e20 494e 5354 414e
1177600 5449 4154 494f 4e20 4641 554c 5420 7769 6c6c 2062 6520 7265 706f 7274 6564 2c20 6f72 2074 6865 2054 6572 6d20 6d61 7920
1177660 6265 0a25 2020 2064 6566 696e 6974 656c 7920 6e6f 7420 6f66 2074 6865 2074 7970 652c 2069 6e20 7768 6963 6820 6361 7365
1177740 2061 2054 5950 4520 4552 524f 5220 6973 2072 6570 6f72 7465 642e 0a25 2020 2059 6f75 2073 686f 756c 6420 7573 6520 7468
1200020 6973 2069 6e20 636f 6d6d 616e 6473 2077 6974 6820 7369 6465 2065 6666 6563 7473 2c20 616e 6420 7368 6f75 6c64 2061 7272
1200100 616e 6765 0a25 2020 2074 6861 7420 6966 2074 6869 7320 7072 6564 6963 6174 6520 646f 6573 206e 6f74 2073 7563 6365 6564
1200160 2074 6865 2073 6964 6520 6566 6665 6374 2873 2920 7769 6c6c 206e 6f74 0a25 2020 2074 616b 6520 706c 6163 652e 0a0a 6d75
1200240 7374 5f62 6528 5479 7065 2c20 5465 726d 2c20 4172 674e 6f2c 2047 6f61 6c29 203a 2d0a 0974 7970 655f 6368 6563 6b28 5479
1200320 7065 2c20 5465 726d 2c20 4172 001c 2240 2823 2938 392f 3037 2f31 3720 6669 6c65 732e 706c 0933 332e 3122 00ad 000c af6c
1200400 0100 2def 0000 3e1f 0000 0004 000c e9d4 000c e9d4 0001 0050 0000 0000 0000 0028 000c 8b20 b27c b66c 0000 02bd 7fff ffff
1200460 000d 69ec 0200 0db5 0100 32b5 0000 3e1f 0000 315f 2cac e9ca 0002 438a 2ca0 e9e2 0000 0000 0000 0001 000b 0224 000b 0224
1200540 0002 438a 000a e150 000c ebac 000c ea40 ffff ffff 0300 4677 0000 3e1f 0000 000c 000b dc74 000b dc74 0021 0000 0000 0000
1200620 0000 47cf b328 ea32 000c 6d1c 0000 0000 0000 47b7 b464 ea41 000c 6c4c 000c eb00 000c c944 0000 0000 000a a824 0200 467f
1200700 0000 3e1f 0000 0008 000d 2050 000d 2050 0021 0000 0000 0000 0000 47c7 b328 3eaf 000c 6ce8 0000 0000 0000 47bf b328 0b3f
1200760 000c 6cb4 0000 0000 28c4 001e 000c eba0 4e1c 0000 0100 2ccf 3050 a874 aab4 0004 9f40 aee8 7220 ea78 0007 5161 6363 6573
1201040 7300 eaa9 0000 47af b328 1d8f 000c 6c18 0000 0000 0008 c86c 0300 4697 0000 3e1f 0000 000c 000d 206c 000d 206c 0021 0000
1201120 0000 0000 0000 473f b328 1d8f 000c 6b84 0000 0000 0009 6d6f 6465 2062 6974 7300 b464 236c 000c 6c80 0000 0000 0008 c88c
1201200 0300 468f 0000 3e1f 0000 000c 000c eb3c 000c ec28 0001 0050 0000 0000 0000 4767 b328 eb29 000c 6b18 0000 0000 27f0 0b3f
1201260 000c ec28 2ca0 eb5a 0000 001c 0000 0006 000c c918 000c ec28 000c eb72 000c ebe0 000c c924 0000 0000 28c4 0028 000c ea88
1201340 56f8 671c 682c 4768 3050 33bc 24d0 0000 000c eb1c 0018 386c 3d30 2340 000c eb1c 0000 4767 b328 ea94 000c 6aec 0000 0000
1201420 28c4 001e 000c ebc0 4e1c 0000 0000 3387 3050 a874 aab4 0002 9f40 aee8 7220 0b3f 28c4 001e 000c ec14 4e1c 0000 0000 1d17
1201500 3050 a874 aab4 000a 9f40 aee8 7220 ebe2 000c e9f9 000c ea94 000c ec01 000c ec20 0000 0000 0000 0000 0000 0000 0000 0000
1201560 000c ebcc 000c eb60 0006 6578 6973 7473 0000 253f 28c4 0014 000c ec28 4e1c 0000 0000 469f 4960 2edc 2954 001c 0002 438a
1201640 9294 9a90 a858 aab4 0007 9f24 a974 9f40 aee9 7220 27f0 0028 000c 9b9c 2520 9294 9860 41fc 0000 0003 4254 0000 0000 0003
1201720 24d0 0000 000c ead4 000c 2eb0 0009 7472 616e 7370 6f73 6500 000c 7368 6f72 7465 725f 6c69 7374 0000 2c78 0018 0002 438a
1202000 4268 0000 0000 21ef 239c 0000 000c 8c5c 0009 6669 6c65 206d 6f64 6500 0004 7761 726e 00a9 0008 5163 616e 6f70 656e 003f
1202060 0007 7375 6273 6571 3000 0000 ffff ffff 0400 46a7 0000 3e1f 0000 0010 000c ed40 000c ed40 0001 0050 0000 0000 0008 c8cc
1202140 0300 46b7 0000 3e1f 0000 000c 000d 208c 000d 208c 0021 0000 0009 0000 000b 7361 6d65 5f6c 656e 6774 6800 0000 27f0 0022
1202220 000c ed64 4e1c 0000 0000 2ccf 4ec4 0000 0000 0003 4f18 0000 0000 2ccf 2edc 0b3f 2cac ed39 0002 438a 2ca0 000b 0000 000c
1202300 0000 0004 000c ed1c 000c edd0 0002 438a 000c edb4 28c4 0022 000c ed90 4e1c 0000 0000 3387 4ec4 0000 0000 000b 4f18 0000
1202360 0000 3387 2edc ed9a 000c ed70 0000 0000 28c4 0022 000c edd0 4e1c 0000 0000 1d17 4ec4 0000 0000 000b 4f18 0000 0000 1d17
1202440 2edc eda9 000c edf5 000c ed28 000c ed9c 0000 0000 0006 6261 636b 7570 0000 0007 2954 0022 0002 438a 4e1c 0000 0000 46c7
1202520 4ec4 0000 0000 000b 4f18 0000 0000 3387 2edc ede9 000c eddc 000c ed88 000c eccc 0300 46a7 0000 3e1f 0000 000c 000c 9eec
1202600 000c 9eec 0001 0050 0000 0000 0006 7365 6c65 6374 0000 0000 0009 6261 636b 2066 696c 6500 000b 7065 726d 7574 6174 696f
1202660 6e00 ef00 0005 756e 696f 6e00 0003 7265 7600 0000 ffff ffff 0200 46cf 0000 3e1f 0000 0008 000c ee94 000c eeb8 0001 0050
1202740 0000 0000 000b 7265 6d6f 7665 5f64 7570 7300 0000 0005 7065 726d 3200 0004 6e74 6831 0000 27f0 ee8a 000c eeb8 2ca0 eea2
1203020 0000 0000 0000 0001 000c a028 000c eeb8 0002 438a 000a edec 2954 000a 0002 438a 228c eeb9 000d 7072 6f70 6572 5f6c 656e
```

```
1203100 6774 6800 0007 6669 6c65 732e 6f00 eec2 000b b2b8 0200 22df 0000 3e1f 0000 0008 000a 18f0 000a 18f0 0000 0000 0000 0000
1203160 000a 6f6e 655f 5c6f 6e67 6572 0000 0000 0004 7365 7473 0000 0005 6c69 7374 7300 000b b2ec 0000 0024 2ca0 1d8f 0000 0000
1203240 0000 0001 000c a134 000c a134 0002 438a 000c 8b40 000b d3c0 0200 22d7 0000 3e1f 0000 0008 000a 18f0 000a 18f0 0000 0000
1203320 0000 0000 000a 636f 7272 6573 706f 6e64 0000 0000 0004 6e74 6830 0000 0004 6c61 7374 0000 000c f058 0000 0048 2ca0 0007
1203400 0000 000c 0000 0004 000c a228 000c a310 0002 438a 000c efb4 000e 48b8 000c efb8 0000 0008 000c efc8 0000 0010 000c efc5
1203460 000c a288 000c f058 0000 0008 0007 6561 6363 6573 7300 efca 0009 6561 6363 6573 732e 6f00 0000 46ef b328 a3e4 000c a3e8
1203540 0000 0000 000c efe4 0000 0000 0008 6465 6c65 7465 5f31 0034 0000 3e7f b328 0db7 000c ca4c 0000 0000 000a 6561 6363 6573
1203620 732e 706c 000c 06cd 000c eee0 0200 22df 0000 3287 0000 0008 000a 18f0 000a 18f0 0000 0000 0000 0000 b464 1818 000d 1980
1203700 000e 6f28 000c f80c 0000 006c 5d10 0000 0100 3037 4b8c 0000 0000 46f7 54a8 228c 000c f098 0000 0024 2ca0 0c83 0000 0000
1203760 0000 0001 000c f054 000c f054 0002 438a 000c efa8 000c f80c 0000 002c b288 b66c 0000 056b 7fff ffff 000f 5e40 0200 0db5
1204040 0100 15ad 0100 33fd 0000 000b 0000 315f 002a 2f68 6f6d 652f 6f73 6173 322f 622f 7175 696e 7475 732f 7077 312e 312f 6c69
1204120 6272 6172 792f 6772 6170 6873 0029 2e0a 002d 2f68 6f6d 652f 6f73 6173 322f 622f 7175 696e 7475 732f 7077 312e 312f 6c69
1204200 6272 6172 792f 6772 6170 6873 2e70 6c00 0035 2f68 6f6d 652f 6f73 6173 322f 622f 7175 696e 7475 732f 6765 6e65 7269 632f
1204260 7170 6c69 6232 2e35 2f6c 6962 7261 7279 2f67 7261 7068 7300 0038 2f68 6f6d 652f 6f73 6173 322f 622f 7175 696e 7475 732f
1204340 6765 6e65 7269 632f 7170 5c69 6232 2e35 2f6c 6962 7261 7279 2f67 7261 7068 732e 706c 0074 0027 2f68 6f6d 652f 6f73 6173
1204420 322f 622f 7175 696e 7475 732f 7077 312e 312f 6c69 6272 6172 792f 6d73 7400 4664 002a 2f68 6f6d 652f 6f73 6173 322f 622f
1204500 7175 696e 7475 732f 7077 312e 312f 6c69 6272 6172 792f 6d73 742e 706c 0067 6e28 0032 2f68 6f6d 652f 6f73 6173 322f 622f
1204560 7175 696e 7475 732f 6765 6e65 7269 632f 7170 6c69 6232 2e35 2f6c 6962 7261 7279 2f6d 7374 0069 6e74 0035 2f68 6f6d 652f
1204640 6f73 6173 322f 622f 7175 696e 7475 732f 6765 6e65 7269 632f 7170 6c69 6232 2e35 2f6c 6962 7261 7279 2f6d 7374 2e70 6c00
1204720 0000 002c 000c f7e4 b27c b66c 0000 056e 7fff ffff 000e 4c08 0200 0db5 0200 2f35 0000 4ddf 0000 02d3 0000 315f 0000 002c
1205000 000d a7f0 b27c b66c 0000 0637 7fff ffff 000c f83c 0200 0db5 0200 224d 0000 4ddf 0000 4db7 0000 315f 2c78 0012 0002 438a
1205060 4e1c 0000 0000 5067 228c 0000 0000 002c 000b 305c b27c b66c 0000 0638 7fff ffff 000d a830 0200 01b5 0200 24bd 0000 3287
1205140 0000 4db7 0000 315f 0000 002c 000e 4ca0 b27c b66c 0000 0572 7fff ffff 000c f8a8 0200 0db5 0200 284d 0000 4db7 0000 4ddf
1205220 0000 315f 0000 0034 000e 575c b27c b66c 0000 0573 7fff ffff 000c f360 0200 0db5 0400 242d 0000 4e07 0000 0013 0000 4db7
1205300 0000 21cf 0000 315f 0000 0034 000c f32c b27c b66c 0000 0574 7fff ffff 000c f394 0200 0db5 0400 242d 0000 4e0f 0000 0013
1205360 0000 4db7 0000 21cf 0000 315f 0000 0034 000c f360 b27c b66c 0000 0575 7fff ffff 000c f3c8 0200 0db5 0400 242d 0000 4e17
1205440 0000 0013 0000 4db7 0000 21cf 0000 315f 0000 0034 000c f394 b27c b66c 0000 0576 7fff ffff 000c f3fc 0200 0db5 0400 242d
1205520 0000 4e1f 0000 0013 0000 4db7 0000 21cf 0000 315f 0000 0034 000c f3c8 b27c b66c 0000 0577 7fff ffff 000c f430 0200 0db5
1205600 0400 242d 0000 4e27 0000 0013 0000 4db7 0000 21cf 0000 315f 0000 0034 000c f3fc b27c b66c 0000 0578 7fff ffff 000c f464
1205660 0200 0db5 0400 242d 0000 4e2f 0000 0013 0000 4db7 0000 21cf 0000 315f 0000 0034 000c f430 b27c b66c 0000 0579 7fff ffff
1205740 000c f498 0200 0db5 0400 242d 0000 4e37 0000 0013 0000 4db7 0000 21cf 0000 315f 0000 0034 000c f464 b27c b66c 0000 057a
1206020 7fff ffff 000c f4cc 0200 0db5 0400 242d 0000 4e3f 0000 0013 0000 4db7 0000 21cf 0000 315f 0000 0034 000c f498 b27c b66c
1206100 0000 057b 7fff ffff 000c f500 0200 0db5 0400 242d 0000 4e47 0000 0013 0000 4db7 0000 21cf 0000 315f 0000 0034 000c f4cc
1206160 b27c b66c 0000 057c 7fff ffff 000c f534 0200 0db5 0400 242d 0000 4e4f 0000 001b 0000 4db7 0000 21cf 0000 315f 0000 0034
1206240 000c f500 b27c b66c 0000 057d 7fff ffff 000c f568 0200 0db5 0400 242d 0000 4e57 0000 001b 0000 4db7 0000 21cf 0000 315f
1206320 0000 0034 000c f534 b27c b66c 0000 057e 7fff ffff 000c f59c 0200 0db5 0400 242d 0000 4e5f 0000 0013 0000 4db7 0000 21cf
1206400 0000 315f 0000 0034 000c f568 b27c b66c 0000 057f 7fff ffff 000c f5d0 0200 0db5 0400 242d 0000 4e67 0000 0013 0000 4db7
1206460 0000 21cf 0000 315f 0000 0034 000c f59c b27c b66c 0000 0580 7fff ffff 000c f604 0200 0db5 0400 242d 0000 4e6f 0000 001b
1206540 0000 4db7 0000 21cf 0000 315f 0000 0034 000c f5d0 b27c b66c 0000 0581 7fff ffff 000c f638 0200 0db5 0400 242d 0000 4e77
1206620 0000 001b 0000 4db7 0000 21cf 0000 315f 0000 0034 000c f604 b27c b66c 0000 0582 7fff ffff 000c f66c 0200 0db5 0400 242d
1206700 0000 4e7f 0000 0013 0000 4db7 0000 21cf 0000 315f 0000 0034 000c f638 b27c b66c 0000 0583 7fff ffff 000c f6a0 0200 0db5
1206760 0400 242d 0000 4e87 0000 0013 0000 4db7 0000 21cf 0000 315f 0000 0034 000c f66c b27c b66c 0000 0584 7fff ffff 000c f6d4
1207040 0200 0db5 0400 242d 0000 4e8f 0000 0013 0000 4db7 0000 21cf 0000 315f 0000 0034 000c f6a0 b27c b66c 0000 0585 7fff ffff
1207120 000c f8d4 0200 0db5 0400 242d 0000 4e97 0000 0013 0000 4db7 0000 21cf 0000 315f 002b 2f68 6f6d 652f 6f73 6173 322f 622f
1207200 7175 696e 7475 732f 7077 312e 312f 6c69 6272 6172 792f 6f72 6473 6574 7300 7061 002e 2f68 6f6d 652f 6f73 6173 322f 622f
1207260 7175 696e 7475 732f 7077 312e 312f 6c69 6272 6172 792f 6f72 6473 6574 732e 706c 0058 203d 0036 2f68 6f6d 652f 6f73 6173
1207340 322f 622f 7175 696e 7475 732f 6765 6e65 7269 632f 7170 6c69 6232 2e35 2f6c 6962 7261 7279 2f6f 7264 7365 7473 0067 6976
1207420 0039 2f68 6f6d 652f 6f73 6173 322f 622f 7175 696e 7475 732f 6765 6e65 7269 632f 7170 6c69 6232 2e35 2f6c 6962 7261 7279
1207500 2f6f 7264 7365 7473 2e70 6c00 0000 002c 000d a7c4 b27c b66c 0000 0587 7fff ffff 000c f268 0200 0db5 0200 2f35 0000 4ecf
1207560 0000 02db 0000 315f 000c f878 0000 002c b288 b66c 0000 0586 7fff ffff 000c f7e4 0200 0db5 0100 15ad 0100 33fd 0000 000b
1207640 0000 315f 0000 002c 000c f294 b27c b66c 0000 05ca 7fff ffff 000b 3028 0200 0db5 0200 224d 0000 4ecf 0000 4e9f 0000 315f
1207720 000f 705f 746f 5f73 5f76 6572 7469 6365 7300 0000 000c fc78 0000 002c b27c b66c 0000 0589 0000 05c9 000a d16d 0200 0db5
1210000 0200 270d 0000 4ecf 0000 4e9f 0000 315f 0000 002c 000c f300 b27c b66c 0000 058b 7fff ffff 000d ad5c 0200 0db5 0200 284d
1210060 0000 4e9f 0000 4ecf 0000 315f 0000 0034 000c f6d4 b27c b66c 0000 058c 7fff ffff 000c f908 0200 0db5 0400 242d 0000 4ed7
1210140 0000 000b 0000 4e9f 0000 21cf 0000 315f 0000 0034 000c f8d4 b27c b66c 0000 058d 7fff ffff 000c f93c 0200 0db5 0400 242d
```

```
1210220 0000 4edf 0000 0013 0000 4e9f 0000 21cf 0000 315f 0000 0034 000c f908 b27c b66c 0000 058e 7fff ffff 000c f970 0200 0db5
1210300 0400 242d 0000 4ee7 0000 001b 0000 4e9f 0000 21cf 0000 315f 0000 0034 000c f93c b27c b66c 0000 058f 7fff ffff 000c f9a4
1210360 0200 0db5 0400 242d 0000 4eef 0000 001b 0000 4e9f 0000 21cf 0000 315f 0000 0034 000c f970 b27c b66c 0000 0590 7fff ffff
1210440 000c f9d8 0200 0db5 0400 242d 0000 4ef7 0000 0013 0000 4e9f 0000 21cf 0000 315f 0000 0034 000c f9a4 b27c b66c 0000 0591
1210520 7fff ffff 000c fa0c 0200 0db5 0400 242d 0000 4eff 0000 001b 0000 4e9f 0000 21cf 0000 315f 0000 0034 000c f9d8 b27c b66c
1210600 0000 0592 7fff ffff 000c fa40 0200 0db5 0400 242d 0000 4f07 0000 0013 0000 4e9f 0000 21cf 0000 315f 0000 0034 000c fa0c
1210660 b27c b66c 0000 0593 7fff ffff 000c fa74 0200 0db5 0400 242d 0000 4f07 0000 001b 0000 4e9f 0000 21cf 0000 315f 0000 0034
1210740 000c fa40 b27c b66c 0000 0594 7fff ffff 000c faa8 0200 0db5 0400 242d 0000 4f0f 0000 001b 0000 4e9f 0000 21cf 0000 315f
1211020 0000 0034 000c fa74 b27c b66c 0000 0595 7fff ffff 000c fadc 0200 0db5 0400 242d 0000 4f0f 0000 0013 0000 4e9f 0000 21cf
1211100 0000 315f 0000 0034 000c faa8 b27c b66c 0000 0596 7fff ffff 000c fb10 0200 0db5 0400 242d 0000 4f17 0000 0013 0000 4e9f
1211160 0000 21cf 0000 315f 0000 0034 000c fadc b27c b66c 0000 0597 7fff ffff 000c fb44 0200 0db5 0400 242d 0000 4f1f 0000 001b
1211240 0000 4e9f 0000 21cf 0000 315f 0000 0034 000c fb10 b27c b66c 0000 0598 7fff ffff 000c fb78 0200 0db5 0400 242d 0000 4f27
1211320 0000 0013 0000 4e9f 0000 21cf 0000 315f 0000 0034 000c fb44 b27c b66c 0000 0599 7fff ffff 000c fbac 0200 0db5 0400 242d
1211400 0000 4ea7 0000 001b 0000 4e9f 0000 21cf 0000 315f 0000 0034 000c fb78 b27c b66c 0000 059a 7fff ffff 000c fbe0 0200 0db5
1211460 0400 242d 0000 4f2f 0000 001b 0000 4e9f 0000 21cf 0000 315f 0000 0034 000c fbac b27c b66c 0000 059b 7fff ffff 000c fc14
1211540 0200 0db5 0400 242d 0000 4eaf 0000 001b 0000 4e9f 0000 21cf 0000 315f 0000 0034 000c fbe0 b27c b66c 0000 059c 7fff ffff
1211620 000c fc48 0200 0db5 0400 242d 0000 4eaf 0000 0013 0000 4e9f 0000 21cf 0000 315f 0000 0034 000c fc14 b27c b66c 0000 059d
1211700 7fff ffff 000d a388 0200 0db5 0400 242d 0000 4eaf 0000 0023 0000 4e9f 0000 21cf 0000 315f 000c fdf4 0000 0144 b27c b66c
1211760 0000 059e 0000 05cb 000c fce0 0200 0db5 0500 1cdd 0000 2def 0000 000b 0000 4e9f 007c 3523 0000 02db 0000 315f 000c fcdc
1212040 0000 002c b4f0 b4e4 0000 059d 7fff ffff 0008 b0dd 0000 0000 0000 0000 000d 0ac4 0002 438a 000f 9948 000c fd14 0000 0038
1212120 b27c b66c 0000 05a0 0000 05cc 000c fd18 0200 0db5 0500 1cdd 0000 4ed7 0000 000b 0000 4e9f 007c 15c3 0000 02db 0000 315f
1212200 000c fd4c 0000 0038 b27c b66c 0000 05a1 0000 05cd 000c fd50 0200 0db5 0500 1cdd 0000 4ed7 0000 0013 0000 4e9f 007c 3ea3
1212260 0000 02db 0000 315f 000c fd84 0000 0038 b27c b66c 0000 05a2 0000 05ce 000c fd88 0200 0db5 0500 1cdd 0000 4edf 0000 0013
1212340 0000 4e9f 007c 1783 0000 02db 0000 315f 000c fdf4 0000 0038 b27c b66c 0000 05a3 0000 05cf 000c fdf8 0200 0db5 0500 1cdd
1212420 0000 4ee7 0000 001b 0000 4e9f 007c 1943 0000 02db 0000 315f 2954 0038 0002 438a 56f8 6840 6a50 4714 4790 001c 3880 37f0
1212500 3280 247c 0008 b97c 0020 3984 0018 001c 38e8 386c 37f0 3cf4 242c 0000 000f 88f4 000c fe9c 0000 0070 b27c b66c 0000 05a4
1212560 0000 05d0 000c fe30 0200 0db5 0500 1cdd 0000 4ee7 0000 002b 0000 4e9f 007c 47a3 0000 02db 0000 315f 000c fe9c 0000 0038
1212640 b27c b66c 0000 05a5 0000 05d1 000c fea0 0200 0db5 0500 1cdd 0000 4eef 0000 001b 0000 4e9f 007c 1b43 0000 02db 0000 315f
1212720 2954 0038 0002 438a 56f8 6854 6aa0 46ec 4790 001c 3858 3804 3280 247c 0008 b97c 0020 3984 0018 001c 38e8 386c 37f0 3cf4
1213000 242c 0000 000f 8a2c 000c ff80 0000 00a8 b27c b66c 0000 05a6 0000 05d2 000c fed8 0200 0db5 0500 1cdd 0000 4eef 0000 002b
1213060 0000 4e9f 007c 5163 0000 02db 0000 315f 000c ff0c 0000 0038 b27c b66c 0000 05a7 0000 05d3 000c ff10 0200 0db5 0500 1cdd
1213140 0000 4ef7 0000 0013 0000 4e9f 007c 1d43 0000 02db 0000 315f 000c ff80 0000 0038 b27c b66c 0000 05a8 0000 05d4 000c ff84
1213220 0200 0db5 0500 1cdd 0000 4f07 0000 0013 0000 4e9f 007c 2103 0000 02db 0000 315f 2c78 003c 0002 438a 56f8 6840 6a50 5758
1213300 6aa0 6af0 001c 3880 37f0 3280 24d0 0000 0008 b97c 0020 3984 0018 001c 38e8 386c 37f0 3cf4 242c 0000 000f 8b28 000d 0040
1213360 0000 0038 b27c b66c 0000 05a9 0000 05d5 000d 0044 0200 0db5 0500 1cdd 0000 4f07 0000 002b 0000 4e9f 007c 5943 0000 02db
1213440 0000 315f 28c4 0044 000c fff8 4e1c 0000 0000 01e7 57b8 6840 6a50 47e4 4880 0018 001c 3880 37f0 3280 24d0 0000 0008 b97c
1213520 0020 3984 0018 001c 38e8 386c 37f0 3cf4 242c 0000 000f 8b28 2954 0044 0002 438a 4e1c 0000 0000 0e27 2520 46ec 4768 5878
1213600 0018 6aa0 6af0 001c 3880 37f0 3280 247c 0008 b97c 0020 3984 0018 001c 38e8 386c 37f0 3cf4 242c 0000 000f 8b28 000d 0168
1213660 0000 00e0 b27c b66c 0000 05aa 0000 05d6 000d 007c 0200 0db5 0500 1cdd 0000 4f07 0000 001b 0000 4e9f 007c 2303 0000 02db
1213740 0000 315f 000d 00b0 0000 0038 b27c b66c 0000 05ab 0000 05d7 000d 00b4 0200 0db5 0500 1cdd 0000 4f0f 0000 001b 0000 4e9f
1214020 007c 2403 0000 02db 0000 315f 000d 00e8 0000 0038 b27c b66c 0000 05ac 0000 05d8 000d 016c 0200 0db5 0500 1cdd 0000 4f3f
1214100 0000 0023 0000 4e9f 007c 62e3 0000 02db 0000 315f 000d 0168 0000 0038 b27c b66c 0000 05ba 0000 05e6 000d 0618 0200 0db5
1214160 0500 1cdd 0000 4f2f 0000 0023 0000 4e9f 007c 96e3 0000 02db 0000 315f 000f 9035 0000 0000 2954 0040 0002 438a 56f8 6868
1214240 6af0 001c 46ec 4768 47f8 0020 3880 37f0 3280 247c 0038 b97c 0024 3984 001c 0020 3984 0018 001c 38e8 386c 37f0 3cf4 234c
1214320 000f 89cc 000d 0320 0000 0188 b27c b66c 0000 05ad 0000 05d9 000d 01a4 0200 0db5 0500 1cdd 0000 4f3f 0000 0033 0000 4e9f
1214400 007c 4e63 0000 02db 0000 315f 000d 01d8 0000 0038 b27c b66c 0000 05ae 0000 05da 000d 01dc 0200 0db5 0500 1cdd 0000 4f0f
1214460 0000 0013 0000 4e9f 007c 2603 0000 02db 0000 315f 000d 0210 0000 0038 b27c b66c 0000 05af 0000 05db 000d 0214 0200 0db5
1214540 0500 1cdd 0000 4f47 0000 001b 0000 4e9f 007c 6d43 0000 02db 0000 315f 000d 0248 0000 0038 b27c b66c 0000 05b0 0000 05dc
1214620 000d 024c 0200 0db5 0500 1cdd 0000 4f17 0000 0013 0000 4e9f 007c 2703 0000 02db 0000 315f 000d 0280 0000 0038 b27c b66c
1214700 0000 05b1 0000 05dd 000d 0284 0200 0db5 0500 1cdd 0000 4f1f 0000 001b 0000 4e9f 007c 2903 0000 02db 0000 315f 000d 02b8
1214760 0000 0038 b27c b66c 0000 05b2 0000 05de 000d 02bc 0200 0db5 0500 1cdd 0000 4f1f 0000 0023 0000 4e9f 007c 77a3 0000 02db
1215040 0000 315f 000d 0320 0000 0038 b27c b66c 0000 05b3 0000 05df 000d 0324 0200 0db5 0500 1cdd 0000 4f27 0000 0013 0000 4e9f
1215120 007c 2ac3 0000 02db 0000 315f 2954 0030 0002 438a 56f8 6840 6a50 5758 6784 6aa0 37f0 3280 24d0 0000 0008 b97c 001c 38e8
1215200 386c 37f0 3cf4 234c 000f 8fc4 000d 0390 0000 0038 b27c b66c 0000 05b4 0000 05e0 000d 0394 0200 0db5 0500 1cdd 0000 4f27
1215260 0000 0023 0000 4e9f 007c 7e23 0000 02db 0000 315f 2954 0038 0002 438a 4e1c 0000 0000 0e27 2520 46ec 4768 5818 6784 6aa0
```

```
1215340  37f0 3280 24d0 0000 0008 b97c 001c 38e8 386c 37f0 3cf4 234c 000f 8fc4 000d 0440 0000 0070 b27c b66c 0000 05b5 0000 05e1
1215420  000d 03cc 0200 0db5 0500 1cdd 0000 4ea7 0000 001b 0000 4e9f 007c 2cc3 0000 02db 0000 315f 000d 0440 0000 0038 b27c b66c
1215500  0000 05b6 0000 05e2 000d 0444 0200 0db5 0500 1cdd 0000 4f4f 0000 0023 0000 4e9f 007c 8643 0000 02db 0000 315f 2954 0040
1215560  0002 438a 56f8 6868 6af0 001c 46ec 4768 47f8 0020 3880 37f0 3280 247c 0008 b97c 0024 3984 001c 0020 3984 0018 001c 38e8
1215640  386c 37f0 3cf4 234c 000f 9138 000d 04a4 0000 0038 b27c b66c 0000 05b7 0000 05e3 000d 04a8 0200 0db5 0500 1cdd 0000 4ea7
1215720  0000 0033 0000 4e9f 007c 89c3 0000 02db 0000 315f 27f0 002c 000f 91a4 4e1c 0000 0000 0de7 3588 373c 0020 3678 0018 5878
1216000  001c 6b88 67b8 3614 0020 22bc 000f 916c 000d 051c 0000 0038 b27c b66c 0000 05b8 0000 05e4 000d 0520 0200 0db5 0500 1cdd
1216060  0000 4f57 0000 0023 0000 4e9f 007c 8b63 0000 02db 0000 315f 2954 0040 0002 438a 56f8 6840 6a50 4714 4790 001c 47f8 0020
1216140  3880 37f0 3280 247c 0008 b97c 0024 3984 001c 0020 3984 0018 001c 38e8 386c 37f0 3cf4 234c 000f 9138 000d 0614 0000 00b8
1216220  b27c b66c 0000 05b9 0000 05e5 000d 00ec 0200 0db5 0500 1cdd 0000 4f2f 0000 001b 0000 4e9f 007c 2e83 0000 02db 0000 315f
1216300  000d 0614 0000 0080 000f 8e4c 000f 8e70 000f 8f64 000f 925c 0000 0000 000f 8c6c 000f 8ddc 000f 90d8 000f 920c 000f 946c
1216360  000f 95c4 000f 9850 000f 98fc 0000 0000 0000 0000 0000 0000 0000 0000 0000 0000 000f 9024 000f 9528 0000 0000 0000 0000
1216440  0000 0000 0000 0000 0000 0000 0000 0000 0000 0000 0000 0000 0000 0000 000f 93c8 2954 0040 0002 438a 56f8 6868 6af0 001c
1216520  46ec 4768 47f8 0020 3880 37f0 3280 247c 0008 b97c 0024 3984 001c 0020 3984 0018 001c 38e8 386c 37f0 3cf4 234c 000f 933c
1216600  000d 0678 0000 0038 b27c b66c 0000 05bb 0000 05e7 000d 067c 0200 0db5 0500 1cdd 0000 4f2f 0000 0033 0000 4e9f 007c 99e3
1216660  0000 02db 0000 315f 27f0 002c 000f 9374 4e1c 0000 0000 0de7 3588 373c 0020 3678 0018 5878 001c 6b88 67b8 3614 0020 22bc
1216740  000f 92dc 000d 0728 0000 0070 b27c b66c 0000 05bc 0000 05e8 000d 06b4 0200 0db5 0500 1cdd 0000 4eff 0000 001b 0000 4e9f
1217020  007c 1f03 0000 02db 0000 315f 000d 0728 0000 0038 b27c b66c 0000 05bd 0000 05e9 000d 072c 0200 0db5 0500 1cdd 0000 4f5f
1217100  0000 0023 0000 4e9f 007c a2e3 0000 02db 0000 315f 2954 0040 0002 438a 56f8 6868 6af0 001c 46ec 4768 47f8 0020 3880 37f0
1217160  3280 247c 0008 b97c 0024 3984 001c 0020 3984 0018 001c 38e8 386c 37f0 3cf4 234c 000f 94cc 000d 078c 0000 0038 b27c b66c
1217240  0000 05be 0000 05ea 000d 0790 0200 0db5 0500 1cdd 0000 4f5f 0000 0033 0000 4e9f 007c a663 0000 02db 0000 315f 27f0 002c
1217320  000f 9504 4e1c 0000 0000 0de7 3588 373c 0020 3678 0018 5878 001c 6b88 67b8 3614 0020 22bc 000f 945c 000d 083c 0000 0070
1217400  b27c b66c 0000 05bf 0000 05eb 000d 07c8 0200 0db5 0500 1cdd 0000 4eaf 0000 001b 0000 4e9f 007c 3043 0000 02db 0000 315f
1217460  000d 083c 0000 0038 b27c b66c 0000 05c0 0000 05ec 000d 0840 0200 0db5 0500 1cdd 0000 4f67 0000 0023 0000 4e9f 007c ada3
1217540  0000 02db 0000 315f 2954 0040 0002 438a 56f8 6868 6af0 001c 46ec 4768 47f8 0020 3880 37f0 3280 247c 0008 b97c 0024 3984
1217620  001c 0020 3984 0018 001c 38e8 386c 37f0 3cf4 234c 000f 9624 000d 08a0 0000 0038 b27c b66c 0000 05c1 0000 05ed 000d 08a4
1217700  0200 0db5 0500 1cdd 0000 4f67 0000 0033 0000 4e9f 007c b123 0000 02db 0000 315f 27f0 002c 000f 965c 4e1c 0000 0000 0de7
1217760  3588 373c 0020 3678 0018 5878 001c 6b88 67b8 3614 0020 22bc 000f 95b4 000d 0960 0000 0070 b27c b66c 0000 05c2 0000 05ee
1220040  000d 08dc 0200 0db5 0500 1cdd 0000 4eaf 0000 0023 0000 4e9f 007c 3303 0000 02db 0000 315f 000d 0960 0000 0038 b27c b66c
1220120  0000 05c3 0000 05ef 000d 0964 0200 0db5 0500 1cdd 0000 4f67 0000 002b 0000 4e9f 007c ba03 0000 02db 0000 315f 2954 0050
1220200  0002 438a 56f8 6868 6af0 001c 46ec 4768 47f8 0020 4880 0018 0024 3880 37f0 3280 24d0 0000 0008 b97c 0028 3984 0020 0024
1220260  3984 001c 0020 3984 0018 001c 38e8 386c 37f0 3cf4 242c 0000 000f 97a4 000d 0a00 0000 0038 b27c b66c 0000 05c4 0000 05f0
1220340  000d 0a04 0200 0db5 0500 1cdd 0000 4eaf 0000 003b 0000 4e9f 007c bd23 0000 02db 0000 315f 27f0 0034 000d 09c8 4e1c 0000
1220420  0000 0de7 3588 373c 0024 3678 0018 5878 001c 6b88 67b8 3754 0018 0020 3614 0024 239c 0000 000f 97d4 28c4 0034 000f 9818
1220500  4e1c 0000 0000 0e27 35b0 0018 5878 001c 6c08 67ec 001c 5878 0020 6c08 67ec 0018 36dc 001c 239c 0000 000f 9740 000d 0a88
1220560  0000 0038 b27c b66c 0000 05c5 0000 05f1 000d 0a8c 0200 0db5 0500 1cdd 0000 4f6f 0000 002b 0000 4e9f 007c bea3 0000 02db
1220640  0000 315f 2954 0050 0002 438a 56f8 6840 6a50 4714 4790 001c 47f8 0020 4880 0018 0024 3880 37f0 3280 24d0 0000 0008 b97c
1220720  0028 3984 0020 0024 3984 001c 0020 3984 0018 001c 38e8 386c 37f0 3cf4 242c 0000 000f 97a4 000d 0b54 0000 0070 b27c b66c
1221000  0000 05c6 0000 05f2 000d 0ac4 0200 0db5 0500 1cdd 0000 4eaf 0000 0013 0000 4e9f 007c 3203 0000 02db 0000 315f 000d 0b54
1221060  0000 0038 b130 b66c 0000 05c7 0000 05f3 000c fcb5 0200 0db5 0500 1cdd 0000 4f77 0000 0023 0000 4e9f 007c c763 0000 02db
1221140  0000 315f 2954 005c 0002 438a 2520 4768 47f8 0020 a858 aab4 0001 9fe8 ad18 0018 a858 a8c8 0018 9db0 ae30 34a0 001c 33a0
1221220  35b0 0018 24d0 0000 000f 98ec 0024 38fc 0020 33bc 3e70 001c 3c48 0000 000f 98ec 0018 386c 3d30 3cf4 242c 0000 000f 8608
1221300  000d 110c 0000 054c 0000 0000 0000 0000 0000 0000 000f 896d 0000 0000 0000 0000 0000 0000 0000 0000 000f 920c 000f 946c
1221360  000f 95c4 000f 9850 000f 98fc 000f 93c8 000d 110c 0000 050c 6c6f 6174 5d29 292e 0a66 6f72 6569 676e 2870 6f77 2c09 0963
1221440  6c5f 706f 7728 0920 2b66 6c6f 6174 2c2b 666c 6f61 742c 5b2d 666c 6f61 745d 2929 2e0a 666f 7265 6967 6e28 7170 5f70 6f77
1221520  2c20 0971 705f 706f 7728 0920 2b66 6c6f 6174 2c2b 696e 7465 6765 722c 5b2d 666c 6f61 745d 2929 2e0a 666f 7265 6967 6e28
1221600  7371 7274 2c09 0973 7172 7428 0920 2b66 6c6f 6174 2c5b 2d66 6c6f 6174 5d29 292e 0a66 6f72 6569 676e 2866 6162 732c 0909
1221660  6661 6273 2809 202b 666c 6f61 742c 5b2d 666c 6f61 745d 2929 2e0a 666f 7265 6967 6e28 6761 6d6d 612c 0909 6761 6d6d 6128
1221740  0920 2b66 6c6f 6174 2c5b 2d66 6c6f 6174 5d29 292e 0a66 6f72 6569 676e 2868 7970 6f74 2c09 0968 7970 6f74 2809 202b 666c
1222020  6f61 742c 2b66 6c6f 6174 2c5b 2d66 6c6f 6174 5d29 292e 0a66 6f72 6569 676e 286a 302c 0909 6a30 2809 202b 666c 6f61 742c
1222100  5b2d 666c 6f61 745d 2929 2e0a 666f 7265 6967 6e28 6a31 2c09 096a 3128 0920 2b66 6c6f 6174 2c5b 2d66 6c6f 6174 5d29 292e
1222160  0a66 6f72 6569 676e 286a 6e2c 0909 6a6e 2809 202b 696e 7465 6765 722c 2b66 6c6f 6174 2c5b 2d66 6c6f 6174 5d29 292e 0a66
1222240  6f72 6569 676e 2879 302c 0909 7930 2809 202b 666c 6f61 742c 5b2d 666c 6f61 745d 2929 2e0a 666f 7265 6967 6e28 7931 2c09
1222320  0979 3128 0920 2b66 6c6f 6174 2c5b 2d66 6c6f 6174 5d29 292e 0a66 6f72 6569 676e 2879 6e2c 0909 796e 2809 202b 696e 7465
1222400  6765 722c 2b66 6c6f 6174 2c5b 2d66 6c6f 6174 5d29 292e 0a66 6f72 6569 676e 2873 696e 2c09 0973 696e 2809 202b 666c 6f61
```

```
1222460  742c 5b2d 666c 6f61 745d 2929 2e0a 666f 7265 6967 6e28 7461 6e2c 0909 7461 6e28 0920 2b66 6c6f 6174 2c5b 2d66 6c6f 6174
1222540  5d29 292e 0a66 6f72 6569 676e 2863 6f73 2c09 0963 6f73 2809 202b 666c 6f61 742c 5b2d 666c 6f61 745d 2929 2e0a 666f 7265
1222620  6967 6e28 6173 696e 2c09 0961 7369 6e28 0920 2b66 6c6f 6174 2c5b 2d66 6c6f 6174 5d29 292e 0a66 6f72 6569 676e 2861 636f
1222700  732c 0909 6163 6f73 2809 202b 666c 6f61 742c 5b2d 666c 6f61 745d 2929 2e0a 666f 7265 6967 6e28 6174 616e 2c09 0961 7461
1222760  6e28 0920 2b66 6c6f 6174 2c5b 2d66 6c6f 6174 5d29 292e 0a66 6f72 6569 676e 2861 7461 6e32 2c09 0961 7461 6e32 2809 202b
1223040  666c 6f61 742c 2b66 6c6f 6174 2c5b 2d66 6c6f 6174 5d29 292e 0a66 6f72 6569 676e 2873 696e 682c 0909 7369 6e68 2809 202b
1223120  666c 6f61 742c 5b2d 666c 6f61 745d 2929 2e0a 666f 7265 6967 6e28 636f 7368 2c09 0963 6f73 6828 0920 2b66 6c6f 6174 2c5b
1223200  2d66 6c6f 6174 5d29 292e 0a66 6f72 6569 676e 2874 616e 682c 0909 7461 6e68 2809 202b 666c 6f61 742c 5b2d 666c 6f61 745d
1223260  2929 2e0a 666f 7265 6967 6e28 6173 696e 682c 0909 6173 696e 6828 0920 2b66 6c6f 6174 2c5b 2d66 6c6f 6174 5d29 292e 0a66
1223340  6f72 6569 676e 2861 636f 7368 2c09 0961 636f 7368 2809 202b 666c 6f61 742c 5b2d 666c 6f61 745d 2929 2e0a 666f 7265 6967
1223420  6e28 6174 616e 682c 0909 6174 616e 6828 0920 2b66 6c6f 6174 2c5b 2d66 6c6f 6174 5d29 292e 0a66 6f72 6569 676e 286c 6465
1223500  7d70 2c09 0973 6361 6c65 2809 202b 666c 6f61 742c 2b69 6e74 6567 6572 2c5b 2d66 6c6f 6174 5d29 292e 0a66 6f72 6569 676e
1223560  2863 6f70 7973 6967 6e2c 0963 6f70 7973 6967 6e28 2b66 6c6f 6174 2c2b 666c 6f61 742c 5b2d 666c 6f61 745d 2929 2e0a 666f
1223640  7265 6967 6e28 2751 4672 6d64 7227 2c09 6672 656d 6169 6e64 6572 282b 666c 6f61 742c 2b66 6c6f 6174 2c5b 2d66 6c6f 6174
1223720  5d29 292e 0a66 6f72 6569 676e 2827 5149 636f 6e76 272c 0927 5149 636f 6e76 2728 2b69 6e74 6567 6572 2c2b 666c 6f61 742c
1224000  2d69 6e74 6567 6572 2c5b 2d69 000d 182c 0000 46ef b328 10aa 000c a56c 0000 0000 b464 1818 000c ca80 000d 7c04 000f 6b65
1224060  7973 5f61 6e64 5f76 616c 7565 7300 0000 0000 0038 000b d5ec b27c b66c 0000 02da 7fff ffff 000d 197c 0200 0db5 0300 22e5
1224140  0000 0001 0000 4707 0000 0007 0000 0007 0000 3287 0000 315f 000d 19b0 0000 02f8 b288 b66c 0000 02db 7fff ffff 000d 1814
1224220  0200 0db5 0100 15ad 0100 33fd 0000 000b 0000 315f 000d 1164 0000 002c b288 b66c 0000 02db 7fff ffff 000d 1110 0200 0db5
1224300  0100 15ad 0100 33fd 0000 000b 0000 315f 000d 1190 0000 002c b288 b66c 0000 02db 7fff ffff 000d 113c 0200 0db5 0100 15ad
1224360  0100 33fd 0000 000b 0000 315f 000d 19b0 0000 0274 000d 119a 0000 0343 000d 11a2 0000 037b 000d 11aa 0000 036b 000d 11b2
1224440  0000 032b 000d 11ba 0000 017b 000d 11c2 0000 037b 000d 11ca 0000 039b 000d 11d2 0000 030b 000d 11da 0000 039b 000d 11e2
1224520  0000 0193 000d 11ea 0000 017b 000d 11f2 0000 0313 000d 11fa 0000 017b 000d 1202 0000 038b 000d 120a 0000 03ab 000d 1212
1224600  0000 034b 000d 121a 0000 0373 000d 1222 0000 03a3 000d 122a 0000 03ab 000d 1232 0000 039b 000d 123a 0000 017b 000d 1242
1224660  0000 033b 000d 124a 0000 032b 000d 1252 0000 0373 000d 125a 0000 032b 000d 1262 0000 0393 000d 126a 0000 034b 000d 1272
1224740  0000 031b 000d 127a 0000 017b 000d 1282 0000 038b 000d 128a 0000 0383 000d 1292 0000 0363 000d 129a 0000 034b 000d 12a2
1225020  0000 0313 000d 12aa 0000 0193 000d 12b2 0000 0173 000d 12ba 0000 01ab 000d 12c2 0000 017b 000d 12ca 0000 0363 000d 12d2
1225100  0000 034b 000d 12da 0000 0313 000d 12e2 0000 0393 000d 12ea 0000 030b 000d 12f2 0000 0393 000d 12fa 0000 03cb 0000 0007
1225160  0500 26f7 0000 1fc7 0000 26ef 0000 027b 000d 0ed5 0000 3a2f 0200 0ad7 0000 0057 0000 0007 0200 0db7 000d 1301 0000 315f
1225240  0056 8763 0100 2f6f 0056 8763 0000 0007 1000 32cf 000d 1344 000d 1348 000d 134c 000d 1350 000d 1354 000d 1358 000d 135c
1225320  000d 1360 000d 1364 000d 1368 000d 136c 000d 1370 000d 1374 000d 1378 000d 137c 000d 1380 0100 1d8f 0000 0db7 000d 1385
1225400  000d 139e 0100 1d8f 0000 2827 000d 1395 000d 13a6 0000 0a0f 000d 13b6 0100 1d8f 0000 3e17 000d 13ad 000d 13be 0000 0abf
1225460  000d 13c6 0000 1677 000d 13d6 0100 1d8f 0000 3f77 000d 13cd 000d 13e6 0100 1d8f 0000 0b3f 000d 13dd 000d 13fe 0000 000b
1225540  0000 0007 0100 253f 000d 13ee 000d 13f5 1300 0345 9010 3fff 81c3 e008 d022 6204 9de3 bfa0 1100 0345 d002 2204 8090 0008
1225620  3680 000f d816 2008 4000 006a 0100 0000 1300 0345 d022 6208 1300 0345 9212 620c 4000 004c 9010 2010 1500 0345 8090 0008
1225700  0680 0037 d022 a204 d816 2008 1b00 003c 980b 000d 2100 0010 80a3 0010 3280 000a 2900 0010 2300 0020 808e 4011 2280 000d
1225760  f456 200c 2700 0295 a410 2015 1080 0028 e424 e1c8 808e 4014 2280 0006 f456 200c 2d00 0295 aa10 2014 1080 0021 ea25 a1c8
1226040  1300 0345 1202 6208 b80e 6007 80a6 8009 3280 0004 1500 0345 1080 0010 b92f 2006 f202 a204 1700 0345 9612 e20c bb2e 6002
1226120  ba07 400b b2a6 6001 0c80 0008 ba27 6004 de56 200e e207 4000 80a3 c011 32bf fffb b2a6 6001 b92f 2003 f016 2008 b00e 001c
1226200  80a6 001c 3280 c004 2f00 0295 1080 0005 b210 2000 ac10 200d ec25 e1c8 b210 3fff 81c7 e008 91e8 0019 9de3 bf60 9207 bfc0
1226260  4000 0016 9010 0018 8090 0008 2280 0004 9210 0019 1080 0005 b010 3fff 7fff ffad 9007 bfc0 b010 0008 81c7 e008 81e8 0000
1226340  8210 204f 91d0 2000 1a80 0004 1b00 0345 9a13 61c0 81c3 4000 0100 0000 81c3 e008 0100 0000 0000 0000 8210 2026 91d0 2000
1226420  1a80 0004 1b00 0345 9a13 61c0 81c3 4000 0100 0000 81c3 e008 0100 0000 0000 0000 0300 0295 d020 61c8 81c3 e008 9010 3fff
1226500  8210 2018 91d0 2000 81c3 e008 9010 0009 0000 0000 0000 0000 4028 2329 3839 2f31 312f 3330 2065 6163 6365 7373 2e63 0933
1226560  362e 3300 ffff ffff 0000 0000 0000 0000 0000 0000 0000 0000 0000 0000 0000 0000 0000 0000 0000 0000 0000 0000 0000 0000
1226640  0000 0000 0000 0000 0000 0000 0000 0000 0000 0000 0000 0000 0000 0000 0000 0000 0000 0000 0000 0000 0000 0000 0000 0000
*
1227520  0000 0000 0000 0000 0000 0000 0000 0000 0000 0000 0000 0000 0000 0000 0000 0000 b464 1516 000d 10dc 000c f048 000b b37c
1227600  0000 0008 0006 6c61 7374 5f31 000c 1188 2c78 0012 0002 438a 4e1c 0000 0000 4877 228c 10bc b464 f000 000c 7230 0000 0000
1227660  27f0 0014 000d 6a98 4e1c 0000 0000 0ad7 3050 c5a8 000c ea20 000c ca6c 000c ef44 0300 22d7 0000 3e1f 0000 000c 000a 18f0
1227740  000a 18f0 0000 0000 0000 0000 0005 5150 5f4c 3200 0000 002c 000b d5c0 b27c b66c 0000 02e3 7fff ffff 000d 18f8 0200 0db5
1230020  0200 22ed 0000 4677 0068 e003 0000 315f 0000 002c 000e 8730 b27c b66c 0000 0523 7fff ffff 000e 87dc 0200 0db5 0200 22ed
1230100  0000 4ba7 0076 1b43 0000 315f 000f 6f72 645f 6164 645f 656c 656d 656e 7400 0a4c 0000 002c 000d 189c b27c b66c 0000 02e4
1230160  7fff ffff 000d 1924 0200 0db5 0200 22ed 0000 467f 0068 e163 0000 315f 0000 002c 000d 18f8 b27c b66c 0000 02e5 7fff ffff
1230240  000d 1950 0200 0db5 0200 22ed 0000 4687 0068 e2a3 0000 315f 0000 002c 000d 1924 b27c b66c 0000 02e6 7fff ffff 000e 6f9c
```

```
1230320 0200 0db5 0200 22ed 0000 46b7 0068 e6e3 0000 315f 0000 0038 000d 10d8 b27c b66c 0000 02e7 7fff ffff 000b 0034 0200 0db5
1230400 0300 22e5 0000 0001 0000 4727 0000 0007 0000 0007 0000 3e1f 0000 315f 000d 297c 0000 0254 b288 b66c 0000 02e8 7fff ffff
1230460 000d 20b4 0200 0db5 0100 15ad 0100 33fd 0000 000b 0000 315f 0003 1a08 0000 002c b288 b66c 0000 02e8 7fff ffff 000d 19b4
1230540 0200 0db5 0100 15ad 0100 33fd 0000 000b 0000 315f 000d 297c 0000 01fc 000d 19f1 0000 315f 003e fea3 0100 2167 003e fea3
1230620 0200 2827 0000 3e17 000d 18e6 0064 43e3 0400 242f 0000 3f77 0000 000b 0000 3e17 0000 21cf 0200 0ad7 0000 004f 0000 0007
1230700 0200 0db7 000d 1a31 0000 315f 003d 3fc3 0100 2167 003d 3fc3 0064 44e3 0400 242f 0000 3f7f 0000 0013 0000 3e17 0000 21cf
1230760 0200 0ad7 0000 004f 0000 0007 0200 0db7 000d 1a6d 0000 315f 003d 3fc3 0100 2167 003d 3fc3 0064 45e3 0400 242f 0000 3f77
1231040 0000 0013 0000 3e17 0000 21cf 0200 0ad7 0000 004f 0000 0007 0200 0db7 000d 1aa9 0000 315f 003d 3fc3 0100 2167 003d 3fc3
1231120 0064 46e3 0400 242f 0000 3f7f 0000 001b 0000 3e17 0000 21cf 0200 0ad7 0000 004f 0000 0007 0200 0db7 000d 1ae5 0000 315f
1231200 003d 3fc3 0100 2167 003d 3fc3 0064 47e3 0400 242f 0000 3f87 0000 000b 0000 3e17 0000 21cf 0200 0ad7 0000 004f 0000 0007
1231260 0200 0db7 000d 1b21 0000 315f 003d 3fc3 0100 2167 003d 3fc3 0064 48e3 0400 242f 0000 3f8f 0000 000b 0000 3e17 0000 21cf
1231340 0200 0ad7 0000 004f 0000 0007 0200 0db7 000d 1b5d 0000 315f 003d 3fc3 0100 2167 003d 3fc3 0064 49e3 0400 242f 0000 3f97
1231420 0000 0003 0000 3e17 0000 21cf 0200 0ad7 0000 004f 0000 0007 0200 0db7 000d 1b99 0000 315f 003d 3fc3 0100 2167 003d 3fc3
1231500 0000 0007 1000 32cf 000d 1bd8 000d 1bdc 000d 1be0 000d 1be4 000d 1be8 000d 1bec 000d 1bf0 000d 1bf4 000d 1bf8 000d 1bfc
1231560 9de3 bfa0 9010 0018 4000 007e 9210 0019 9090 0008 2280 0004 b010 2000 1100 0295 f002 21c8 81c7 e008 81e8 0000 9de3 bfa0
1231640 4000 007e 9010 0018 8090 0008 2280 0004 b010 2000 1100 0295 f002 21c8 81c7 e008 81e8 0000 9de3 bf60 9207 bfc0 7fff fe4f
1231720 9010 0018 8090 0008 2280 0005 8090 0019 1100 0295 1090 0018 f202 21c8 3680 0009 d817 bfc8 d217 bfc8 1700 0010 808a 400b
1232000 3280 0011 b210 2000 1080 000f b210 2014 1f00 0010 808b 000f 2280 0004 920e 6007 1080 0009 b210 2015 7fff fdd6 9007 bfc0
1232060 8090 0008 2280 0004 b210 2000 2100 0295 f204 21c8 81c7 e008 91e8 0019 9de3 bf60 9207 bfc0 7fff fe2d 9010 0018 8090 0008
1232140 3280 0009 9210 0019 d017 bfc8 1500 0010 808a 000a 2280 0004 9210 0019 1080 001d b010 2015 4000 0031 9010 0018 8090 0008
1232220 2680 0006 8090 0019 4000 0018 0100 0000 1080 C014 b010 2000 3280 0005 9210 21ff 1700 0295 1080 000f f002 e1c8 4000 0019
1232300 9010 0018 ba10 0008 8090 001d 1680 0004 1900 0295 1080 0007 f003 21c8 4000 0007 9010 001d 4000 002d 9010 0018 b010 2000
1232360 81c7 e008 81e8 0000 8210 2006 91d0 2000 1a80 0004 1b00 0345 9a13 61c0 81c3 4000 0100 0000 81c3 e008 0100 0000 0000 0000
1232440 8210 2008 91d0 2000 1a80 0004 1b00 0345 9a13 61c0 81c3 4000 0100 0000 81c3 e008 0100 0000 0000 0000 8210 2005 91d0 2000
1232520 1a80 0004 1b00 0345 9a13 61c0 81c3 4000 0100 0000 81c3 e008 0100 0000 0000 0000 8210 2080 91d0 2000 1a80 0004 1b00 0345
1232600 9a13 61c0 81c3 4000 0100 0000 81c3 e008 0100 0000 0000 0000 8210 200a 91d0 2000 1a80 0004 1b00 0345 9a13 61c0 81c3 4000
1232660 0100 0000 81c3 e008 0100 0000 0000 0000 000d 1c00 000d 1c2c 000d 1c54 000d 1cdc 0000 0000 0000 0000 4028 2329 3838 2f31
1232740 312f 3039 2066 696c 6573 2e63 0932 372e 3600 0000 0000 0000 0000 0000 0000 0000 0000 0000 0000 0000 0000 0000 0000 0000
1233020 0000 0000 0000 0000 0000 0000 0000 0000 0000 0000 0000 0000 0000 0000 0000 0000 0000 0000 0000 0000 0000 0000 0000 0000
*
1233540 0000 0000 0000 0000 0000 0000 0000 0000 0000 4677 b328 1fe9 000d 1890 0000 0000 0000 467f b328 315f 000d 18fc 0000 0000
1233620 0000 4687 b328 027b 000d 1928 0000 0000 0015 3178 000b dc24 000f 4c78 0000 0000 0000 46b7 b328 3e5f 000d 1954 0000 0000
1233700 2c78 001a 0002 438a 7ae4 0000 805c 7c28 000d 1c2c 0004 88d0 228c 204d 2c78 001e 0002 438a 7ae4 0000 8130 805c 7ebc 0000
1233760 000d 1c54 0008 88ec 228c 2080 2c78 001e 0002 438a 7ae4 0000 8130 805c 7ebc 0000 000d 1cdc 0008 88ec 228c 3e17 000b ddd8
1234040 0000 0010 000d 297c 0000 0008 000d 6b00 000c 8c4c 0200 3fb7 0000 3287 0000 0008 000c 0830 000c 0830 0041 0000 0000 0000
1234120 000d 20c0 0300 3fb7 0000 3287 0000 000c 000d 2100 000d 2100 0041 0000 0000 0000 2c78 0010 0002 438a 239c 0000 000c 8c5c
1234200 000c 8c6c 0000 3fbf 0000 3287 0000 0000 000d 2130 000d 2130 0041 0000 0000 0000 2c78 0010 0002 438a 239c 0000 000c 8c7c
1234260 000c 8c8c 0200 3fc7 0000 3287 0000 0008 000d 2160 000d 2160 0041 0000 0000 0000 2c78 0010 0002 438a 239c 0000 000c 8c9c
1234340 000c 8cac 0100 3fcf 0000 3287 0000 0004 000d 2190 000d 2190 0041 0000 0000 0000 2c78 0010 0002 438a 239c 0000 000c 8cbc
1234420 000c 8ccc 0100 3fd7 0000 3287 0000 0004 0001 21c0 000d 21c0 0041 0000 0000 0000 2c78 0010 0002 438a 239c 0000 000c 8cdc
1234500 000c 8d0c 0100 3fdf 0000 3287 0000 0004 000d 21f0 000d 21f0 0041 0000 0000 0000 2c78 0010 0002 438a 239c 0000 000c 8cfc
1234560 000d 21d0 0200 3fdf 0000 3287 0000 0008 000d 2220 000d 2220 0041 0000 0000 0000 2c78 0010 0002 438a 239c 0000 000c 8d1c
1234640 000c 8d5c 0100 3fe7 0000 3287 0000 0004 000d 2250 000d 2250 0041 0000 0000 0000 2c78 0010 0002 438a 239c 0000 000c 8d3c
1234720 000d 2230 0200 3fe7 0000 3287 0000 0008 000d 2280 000d 2280 0041 0000 0000 0000 2c78 0010 0002 438a 239c 0000 000c 8d6c
1235000 000c 8d7c 0300 3fef 0000 3287 0000 000c 000d 22b0 000d 22b0 0041 0000 0000 0000 2c78 0010 0002 438a 239c 0000 000c 8d8c
1235060 000c 8dac 0200 3ff7 0000 3287 0000 0008 000d 22e0 000d 22e0 0041 0000 0000 0000 2c78 0010 0002 438a 239c 0000 000c 8dbc
1235140 000c 8de4 0200 3fff 0000 3287 0000 0008 000d 2310 000d 2310 0041 0000 0000 0000 2c78 0010 0002 438a 239c 0000 000c 8df4
1235220 000c 8e1c 0200 4007 0000 3287 0000 0008 000d 2340 000d 2340 0041 0000 0000 0000 2c78 0010 0002 438a 239c 0000 000c 8e2c
1235300 b464 1838 000c 705c 0000 0000 b464 2354 000c 6e54 0000 0000 b464 2360 000c 6dec 0000 0000 b464 eb04 000c 6be4 0000 0000
1235360 b464 2378 000c 6bb0 000d 2374 b464 7070 000e 5524 0000 0000 0007 7375 6d6c 6973 7400 23a4 0007 7375 6273 6571 3100 23b0
1235440 0006 7375 6273 6571 000d 23bc 0009 7365 6c65 6374 6368 6b00 0007 7265 7665 7273 6500 23d4 0007 6e6d 656d 6265 7200 23e0
1235520 0006 6e65 7874 746f 000d 23ec 0007 6973 5f6c 6973 7400 23f8 0006 6465 6c65 7465 000d 2404 0008 6669 6c65 732e 706c 0010
1235600 0000 002c 000d 8484 b27c b66c 0000 0399 7fff ffff 000c 6ae8 0200 0db5 0200 2f35 0000 4787 0000 02a3 0000 315f 0000 002c
1235660 000d 8824 b27c b66c 0000 03d7 7fff ffff 000c 6b14 0200 0db5 0200 224d 0000 4787 0000 4747 0000 315f 000e 7361 7665 5f69
1235740 6e73 7461 6e63 6573 0000 0000 0000 002c 000d 2954 b27c b66c 0000 03d8 7fff ffff 000b 0868 0200 0db5 0200 24bd 0000 3287
```

```
1236020  0000 4747 0000 315f 0000 002c 000c 6b80 b27c b66c 0000 039d 7fff ffff 000d 855c 0200 0db5 0200 284d 0000 4747 0000 4787
1236100  0000 315f 0000 0034 000c 71f8 b27c b66c 0000 039e 7fff ffff 000d 2510 0200 0db5 0400 242d 0000 48c7 0000 001b 0000 4747
1236160  0000 21cf 0000 315f 0000 0034 000d 24dc b27c b66c 0000 039f 7fff ffff 000d 2544 0200 0db5 0400 242d 0000 48cf 0000 001b
1236240  0000 4747 0000 21cf 0000 315f 0000 0034 000d 2510 b27c b66c 0000 03a0 7fff ffff 000d 2578 0200 0db5 0400 242d 0000 48d7
1236320  0000 000b 0000 4747 0000 21cf 0000 315f 0000 0034 000d 2544 b27c b66c 0000 03a1 7fff ffff 000d 25ac 0200 0db5 0400 242d
1236400  0000 48df 0000 0013 0000 4747 0000 21cf 0000 315f 0000 0034 000d 2578 b27c b66c 0000 03a2 7fff ffff 000d 25e0 0200 0db5
1236460  0400 242d 0000 48e7 0000 001b 0000 4747 0000 21cf 0000 315f 0000 0034 000d 25ac b27c b66c 0000 03a3 7fff ffff 000d 2614
1236540  0200 0db5 0400 242d 0000 48ef 0000 0013 0000 4747 0000 21cf 0000 315f 0000 0034 000d 25e0 b27c b66c 0000 03a4 7fff ffff
1236620  000d 2648 0200 0db5 0400 242d 0000 48ef 0000 001b 0000 4747 0000 21cf 0000 315f 0000 0034 000d 2614 b27c b66c 0000 03a5
1236700  7fff ffff 000d 267c 0200 0db5 0400 242d 0000 48f7 0000 0013 0000 4747 0000 21cf 0000 315f 0000 0034 000d 2648 b27c b66c
1236760  0000 03a6 7fff ffff 000d 26b0 0200 0db5 0400 242d 0000 48f7 0000 001b 0000 4747 0000 21cf 0000 315f 0000 0034 000d 267c
1237040  b27c b66c 0000 03a7 7fff ffff 000d 26e4 0200 0db5 0400 242d 0000 48ff 0000 0013 0000 4747 0000 21cf 0000 315f 0000 0034
1237120  000d 26b0 b27c b66c 0000 03a8 7fff ffff 000d 2718 0200 0db5 0400 242d 0000 4907 0000 0023 0000 4747 0000 21cf 0000 315f
1237200  0000 0034 000d 26e4 b27c b66c 0000 03a9 7fff ffff 000d 274c 0200 0db5 0400 242d 0000 490f 0000 0013 0000 4747 0000 21cf
1237260  0000 315f 0000 0034 000d 2718 b27c b66c 0000 03aa 7fff ffff 000d 2780 0200 0db5 0400 242d 0000 4837 0000 001b 0000 4747
1237340  0000 21cf 0000 315f 0000 0034 000d 274c b27c b66c 0000 03ab 7fff ffff 000d 27b4 0200 0db5 0400 242d 0000 483f 0000 001b
1237420  0000 4747 0000 21cf 0000 315f 0000 0034 000d 2780 b27c b66c 0000 03ac 7fff ffff 000d 27e8 0200 0db5 0400 242d 0000 4917
1237500  0000 0013 0000 4747 0000 21cf 0000 315f 0000 0034 000d 27b4 b27c b66c 0000 03ad 7fff ffff 000d 281c 0200 0db5 0400 242d
1237560  0000 491f 0000 001b 0000 4747 0000 21cf 0000 315f 0000 0034 000d 27e8 b27c b66c 0000 03ae 7fff ffff 000d 2850 0200 0db5
1237640  0400 242d 0000 4927 0000 0013 0000 4747 0000 21cf 0000 315f 0000 0034 000d 281c b27c b66c 0000 03af 7fff ffff 000d 2884
1237720  0200 0db5 0400 242d 0000 492f 0000 001b 0000 4747 0000 21cf 0000 315f 0000 0034 000d 2850 b27c b66c 0000 03b0 7fff ffff
1240000  000d 28b8 0200 0db5 0400 242d 0000 4937 0000 001b 0000 4747 0000 21cf 0000 315f 0000 0034 000d 2884 b27c b66c 0000 03b1
1240060  7fff ffff 000d 28ec 0200 0db5 0400 242d 0000 493f 0000 0013 0000 4747 0000 21cf 0000 315f 0000 0034 000d 28b8 b27c b66c
1240140  0000 03b2 7fff ffff 000d 2920 0200 0db5 0400 242d 0000 493f 0000 001b 0000 4747 0000 21cf 0000 315f 0000 0034 000d 28ec
1240220  b27c b66c 0000 03b3 7fff ffff 000d 8588 0200 0db5 0400 242d 0000 493f 0000 0023 0000 4747 0000 21cf 0000 315f 0000 002c
1240300  000c 6b54 b27c b66c 0000 03b4 7fff ffff 000d 2484 0200 0db5 0200 24bd 0000 4747 0000 3a8f 0000 315f 000d 2ab4 0000 010c
1240360  b27c b66c 0000 03b5 0000 03d9 000d 29e4 0200 0db5 0500 1cdd 0000 2def 0000 000b 0000 4747 006e 3fe3 0000 02a3 0000 315f
1240440  000d 29e0 0000 002c b4f0 b4e4 0000 03b4 7fff ffff 0008 b0dd 0000 0000 0000 0000 000d 3208 0002 438a 000d d84c 000d 2a18
1240520  0000 0038 b27c b66c 0000 03b7 0000 03da 000d 2a1c 0200 0db5 0500 1cdd 0000 48c7 0000 001b 0000 4747 006d 24a3 0000 02a3
1240600  0000 315f 000d 2a50 0000 0038 b27c b66c 0000 03b8 0000 03db 000d 2a54 0200 0db5 0500 1cdd 0000 48cf 0000 001b 0000 4747
1240660  006d 25a3 0000 02a3 0000 315f 000d 2ab4 0000 0038 b27c b66c 0000 03b9 0000 03dc 000d 2ab8 0200 0db5 0500 1cdd 0000 48df
1240740  0000 0013 0000 4747 006d 27a3 0000 02a3 0000 315f 27f0 002a 000d 7620 2520 46ec 35c8 3280 24d0 0000 000b 8888 0014 37f0
1241020  40cc 0000 000b 88c8 000c 2ecc c5a8 6265 000d 2b54 0000 0070 b27c b66c 0000 03ba 0000 03dd 000d 2af0 0200 0db5 0500 1cdd
1241100  0000 48d7 0000 000b 0000 4747 006d 26a3 0000 02a3 0000 315f 000d 2b54 0000 0038 b27c b66c 0000 03bb 0000 03de 000d 2b58
1241160  0200 0db5 0500 1cdd 0000 4837 0000 001b 0000 4747 006d 3223 0000 02a3 0000 315f 2954 0030 0002 438a 5758 67ec 001c 55f0
1241240  67ec 0018 55f0 6464 57b8 6c84 001c 55f0 6c84 0018 55f0 6c34 6784 22bc 000d a644 000d 2bbc 0000 0038 b27c b66c 0000 03bc
1241320  0000 03df 000d 2bc0 0200 0db5 0500 1cdd 0000 483f 0000 001b 0000 4747 006d 3323 0000 02a3 0000 315f 2954 0030 0002 438a
1241400  5758 67ec 001c 55f0 67ec 0018 55f0 6464 57b8 6c84 001c 55f0 6c84 0018 55f0 6c34 6784 22bc 000d a664 000d 2c6c 0000 00a8
1241460  b27c b66c 0000 03bd 0000 03e0 000d 2bf8 0200 0db5 0500 1cdd 0000 4907 0000 0023 0000 4747 006d 2fa3 0000 02a3 0000 315f
1241540  000d 2c2c 0000 0038 b27c b66c 0000 03be 0000 03e1 000d 2c70 0200 0db5 0500 1cdd 0000 48ef 0000 0013 0000 4747 006d 29e3
1241620  0000 02a3 0000 315f 000d 2c6c 0000 0038 b27c b66c 0000 03c9 0000 03ec 000d 2f80 0200 0db5 0500 1cdd 0000 48ef 0000 001b
1241700  0000 4747 006d 2b23 0000 02a3 0000 315f 000d cbdc 000d c864 000d 2e24 0000 0188 b27c b66c 0000 03bf 0000 03e2 000d 2ca8
1241760  0200 0db5 0500 1cdd 0000 4927 0000 0013 0000 4747 006d 36a3 0000 02a3 0000 315f 000d 2cdc 0000 0038 b27c b66c 0000 03c0
1242040  0000 03e3 000d 2ce0 0200 0db5 0500 1cdd 0000 4917 0000 0013 0000 4747 006d 3423 0000 02a3 0000 315f 000d 2d14 0000 0038
1242120  b27c b66c 0000 03c1 0000 03e4 000d 2d18 0200 0db5 0500 1cdd 0000 48ff 0000 0013 0000 4747 006d 2e63 0000 02a3 0000 315f
1242200  000d 2d4c 0000 0038 b27c b66c 0000 03c2 0000 03e5 000d 2d50 0200 0db5 0500 1cdd 0000 490f 0000 0013 0000 4747 006d 30e3
1242260  0000 02a3 0000 315f 000d 2d84 0000 0038 b27c b66c 0000 03c3 0000 03e6 000d 2d88 0200 0db5 0500 1cdd 0000 4957 0000 0013
1242340  0000 4747 006e 5e63 0000 02a3 0000 315f 000d 2dbc 0000 0038 b27c b66c 0000 03c4 0000 03e7 000d 2dc0 0200 0db5 0500 1cdd
1242420  0000 4957 0000 0023 0000 4747 006e 63a3 0000 02a3 0000 315f 000d 2e24 0000 0038 b27c b66c 0000 03c5 0000 03e8 000d 2e28
1242500  0200 0db5 0500 1cdd 0000 48f7 0000 001b 0000 4747 006d 2d63 0000 02a3 0000 315f 28c4 0030 000d cd30 56f8 6854 69b0 46ec
1242560  477c 37f0 3bf4 0000 000b 88c8 001c 2ecc 37b0 56f8 6dc4 6784 2410 0000 000d a5ac 000d 2ec4 0000 0070 b27c b66c 0000 03c6
1242640  0000 03e9 000d 2e60 0200 0db5 0500 1cdd 0000 48f7 0000 0013 0000 4747 006d 2c23 0000 02a3 0000 315f 000d 2ec4 0000 0038
1242720  b27c b66c 0000 03c7 0000 03ea 000d 2ec8 0200 0db5 0500 1cdd 0000 495f 0000 001b 0000 4747 006e 6b63 0000 02a3 0000 315f
1243000  28c4 0030 000d ce20 56f8 6854 69b0 46ec 477c 3804 3ba0 0000 000d ce10 001c 2ecc 37b0 56f8 6dc4 6784 2410 0000 000d cd6c
1243060  000d 3050 0000 0160 b27c b66c 0000 03c8 0000 03eb 000d 2c30 0200 0db5 0500 1cdd 0000 4967 0000 0013 0000 4747 006e 7083
```

```
1243140 0000 02a3 0000 315f 000d 2f7c 0000 0080 000d cadc 000d cff0 000d ca90 000d ceb0 000d cf38 000d d15c 0000 0000 0000 0000
1243220 000d cbdc 000d c1a4 000d ce34 000d d290 000d d31c 0000 0000 0000 0000 0000 0000 0000 0000 0000 0000 0000 0000 0000
1243300 0000 0000 0000 0000 0000 0000 0000 0000 0000 0000 0000 0000 000d d0e8 000d ca58 000d cce4 000d cb08 000d 2fb4 0000 0038
1243360 b27c b66c 0000 03ca 0000 03ed 000d 2fb8 0200 0db5 0500 1cdd 0000 492f 0000 001b 0000 4747 006d 37e3 0000 02a3 0000 315f
1243440 000d 2fec 0000 0038 b27c b66c 0000 03cb 0000 03ee 000d 2ff0 0200 0db5 0500 1cdd 0000 4937 0000 001b 0000 4747 006d 3963
1243520 0000 02a3 0000 315f 000d 3050 0000 0038 b27c b66c 0000 03cc 0000 03ef 000d 3054 0200 0db5 0500 1cdd 0000 4937 0000 0023
1243600 0000 4747 006e 7be3 0000 02a3 0000 315f 2954 002c 0002 438a 56f8 6580 001c 370c 0018 57b8 6c84 001c 6784 4550 6c84 001c
1243660 6c48 0018 239c 0000 000d cf7c 000d 31cc 0000 0150 b27c b66c 0000 03cd 0000 03f0 000d 308c 0200 0db5 0500 1cdd 0000 491f
1243740 0000 001b 0000 4747 006d 3563 0000 02a3 0000 315f 000d 30c0 0000 0038 b27c b66c 0000 03ce 0000 03f1 000d 30c4 0200 0db5
1244020 0500 1cdd 0000 491f 0000 0023 0000 4747 006e 83a3 0000 02a3 0000 315f 000d 30f8 0000 0038 b27c b66c 0000 03cf 0000 03f2
1244100 000d 30fc 0200 0db5 0500 1cdd 0000 48e7 0000 001b 0000 4747 006d 28a3 0000 02a3 0000 315f 000d 3130 0000 0038 b27c b66c
1244160 0000 03d0 0000 03f3 000d 3134 0200 0db5 0500 1cdd 0000 493f 0000 001b 0000 4747 006d 3c63 0000 02a3 0000 315f 000d 3168
1244240 0000 0038 b27c b66c 0000 03d1 0000 03f4 000d 316c 0200 0db5 0500 1cdd 0000 493f 0000 0023 0000 4747 006d 3d63 0000 02a3
1244320 0000 315f 000d 31cc 0000 0038 b27c b66c 0000 03d2 0000 03f5 000d 31d0 0200 0db5 0500 1cdd 0000 493f 0000 0013 0000 4747
1244400 006d 3ae3 0000 02a3 0000 315f 2c78 002c 0002 438a 2520 46d8 332c 247c 000d d280 0014 3858 4368 39f8 000b 8848 0014 2ecc
1244460 3d00 4a7c 000c 723c 000d 4d9c 0000 1250 b27c b66c 0000 03d3 0000 03f6 000d 3208 0200 0db5 0500 1cdd 0000 496f 0000 0013
1244540 0000 4747 006e 9403 0000 02a3 0000 315f 000d 323c 0000 0038 b130 b66c 0000 03d4 0000 03f7 000d 29b9 0200 0db5 0500 1cdd
1244620 0000 4977 0000 0013 0000 4747 006e 9863 0000 02a3 0000 315f 000d 497c 0000 11e0 6572 2c20 616e 6420 626f 7468 204c 6973
1244700 7431 2061 6e64 204c 6973 7432 2068 6176 6520 6578 6163 746c 7920 4c65 6e67 7468 2065 6c65 6d65 6e74 732e 2020 4e6f 0a25
1244760 2020 2072 656c 6174 696f 6e20 6265 7477 6565 6e20 7468 6520 656c 656d 656e 7473 206f 6620 7468 6520 6c69 7374 7320 6973
1245040 2069 6d70 6c69 6564 2e20 2049 6620 4c65 6e67 7468 0a25 2020 2069 7320 696e 7374 616e 7469 6174 6564 2c20 6f72 2069 6620
1245120 6569 7468 6572 204c 6973 7431 206f 7220 4c69 7374 3220 6973 2062 6f75 6e64 2074 6f20 6120 7072 6f70 6572 0a25 2020 206c
1245200 6973 742c 2073 616d 655f 6c65 6e67 7468 2069 7320 6465 7465 726d 696e 6174 6520 616e 6420 7465 726d 696e 6174 696e 672e
1245260 2020 6c69 6272 6172 7928 6c65 6e67 7468 290a 2520 2020 6861 7320 6d6f 7265 2070 7265 6469 6361 7465 7320 7769 7468 2074
1245340 6969 7320 7374 7275 6374 7572 652e 0a0a 7361 6d65 5f6c 656e 6774 6828 4c69 7374 312c 204c 6973 7432 2c20 4c65 6e67 7468
1245420 2920 3a2d 0a09 2920 2020 696e 7465 6765 7228 4c65 6e67 7468 2920 2d3e 0a09 2020 2020 4c65 6e67 7468 203e 3d20 302c 0a09
1245500 2020 2020 2773 616d 6520 6c65 6e67 7468 2728 4c65 6e67 7468 2c20 4c69 7374 312c 204c 6973 7432 290a 093b 2020 206e 6f6e
1245560 7661 7228 4c65 6e67 7468 2920 2d3e 0a09 2020 2020 7368 6f75 6c64 5f62 6528 696e 7465 6765 722c 204c 656e 6774 682c 2033
1245640 2c20 7361 6d65 5f6c 656e 6774 6928 4c69 7374 312c 4c69 7374 322c 4c65 6e67 7468 2929 0a09 3b20 2020 7661 7228 4c69 7374
1245720 3129 202d 3e09 0925 2073 7761 7020 4c69 7374 3120 616e 6420 4c69 7374 3220 6172 6f75 6e64 2074 6f0a 0920 2020 2027 7361
1246000 6d65 206c 656e 6774 6827 284c 6973 7432 2c20 4c69 7374 312c 2030 2c20 4c65 6e67 7468 290a 093b 0a09 2020 2020 2773 616d
1246060 6520 6c65 6e67 7468 2728 4c69 7374 312c 204c 6973 7432 2c20 302c 204c 656e 6774 6829 0a09 292e 0a0a 2773 616d 6520 6c65
1246140 6e67 7468 2728 302c 204c 6973 7431 2c20 4c69 7374 3229 203a 2420 212c 0925 2064 656c 6179 2075 6e69 6669 6361 7469 6f6e
1246220 0a09 4c69 7374 3120 3d20 5b5d 2c09 0909 2520 746f 2062 6c6f 636b 2069 6e66 696e 6974 6520 6c6f 6f70 730a 094c 6973 7432
1246300 203d 205b 5d2e 0a27 7361 6d65 206c 656e 6774 6827 284e 2c20 5b5f 7c52 6573 7431 5d2c 205b 5f7c 5265 7374 325d 2920 3a2d
1246360 0a09 4d20 6973 204e 2d31 2c09 0909 2520 4e20 3e20 302c 204d 203e 3d20 300a 0927 7361 6d65 206c 656e 6774 6827 284d 2c20
1246440 5265 7374 312c 2052 6573 7432 292e 0a0a 0a27 7361 6d65 206c 656e 6774 6827 285b 5d2c 205b 5d2c 204e 2c20 4e29 2e0a 2773
1246520 616d 6520 6c65 6e67 7468 2728 5b5f 7c52 6573 7431 5d2c 205b 5f7c 5265 7374 325d 2c20 492c 204e 2920 3a2d 0a09 4a20 6973
1246600 2049 2b31 2c0a 0927 7361 6d65 206c 656e 6774 6827 2852 6573 7431 2c20 5265 7374 322c 204a 2c20 4e29 2e0a 0a0a 0a25 2020
1246660 2073 656c 6563 7428 3f58 2c20 3f58 6c69 7374 2c20 3f59 2c20 3f59 6c69 7374 290a 2520 2020 6973 2074 7275 6520 7768 656e
1246740 2058 2069 7320 7468 6520 4b74 6820 6d65 6d62 6572 206f 6620 586c 6973 7420 616e 6420 5920 7468 6520 4b74 6820 656c 656d
1247020 656e 7420 6f66 2059 6c69 7374 0a25 2020 2066 6f72 2073 6f6d 6520 4b2c 2061 6e64 2061 7061 7274 2066 726f 6d20 7468 6174
1247100 2058 6c69 7374 2061 6e64 2059 6c69 7374 2061 7265 2074 6865 2073 616d 652e 2020 596f 7520 6361 6e0a 2520 2020 7573 6520
1247160 6974 2074 6f20 7265 706c 6163 6520 5820 6279 2059 206f 7220 7669 6365 2076 6572 7361 2e20 2045 6974 6865 7220 586c 6973
1247240 7420 6f72 2059 6c69 7374 2073 696f 756c 640a 2520 2020 6265 2061 2070 726f 7065 7220 6c69 7374 2e20 2054 6869 7320 6973
1247320 2076 6572 7920 6c69 6b65 2073 6574 733a 7365 6c65 6374 2f33 2e20 204e 6f74 6520 7468 6174 2074 6865 0a25 2020 2061 7267
1247400 756d 656e 7473 2061 7265 206c 696b 6520 7468 6520 6172 6775 6d65 6e74 7320 6f66 206d 656d 6265 722f 322c 2074 7769 6365
1247460 2e0a 0a73 656c 6563 7428 582c 205b 587c 5461 696c 5d2c 2059 2c20 5b59 7c54 6169 6c5d 292e 0a73 656c 6563 7428 582c 205b
1247540 4865 6164 7c58 6c69 7374 5d2c 2059 2c20 5b48 6561 647c 596c 6973 745d 2920 3a2d 0a09 7365 6c65 6374 2858 2c20 586c 6973
1247620 742c 2059 2c20 596c 6973 7429 2e0a 0a0a 0a25 2020 2073 656c 6563 7463 686b 283f 582c 202b 586c 6973 742c 203f 592c 202b
1247700 596c 6973 7429 0a25 2020 2069 7320 746f 2073 656c 6563 742f 3420 6173 206d 656d 6265 7268 636b 2f32 2069 7320 746f 206d
1247760 656d 6265 722f 322e 2020 5468 6174 2069 732c 2069 7420 6669 6e64 7320 7468 650a 2520 2020 6669 7273 7420 4b20 7375 6368
1250040 2074 6861 7420 5820 756e 6966 6965 7320 7769 7468 2074 6865 204b 7468 2065 6c65 6d65 6e74 206f 6620 586c 6973 7420 616e
1250120 6420 5920 7769 7468 0a25 2020 2074 6865 204b 7468 2065 6c65 6d65 6e74 206f 6620 596c 6973 742c 2061 6e64 2069 7420 636f
1250200 6d6d 6974 7320 746f 2074 6865 2062 696e 6469 6e67 7320 7468 7573 2066 6f75 6e64 2e0a 2520 2020 4966 2079 6f75 2068 6176
```

```
1250260 6520 4b65 7973 2061 6e64 2056 616c 7565 7320 696e 2022 7061 7261 6c6c 656c 2220 6c69 7374 732c 2079 6f75 2063 616e 2075
1250340 7365 2074 6869 7320 746f 0a25 2020 2066 696e 6420 7468 6520 5661 6c75 6520 6173 736f 6369 6174 6564 2077 6974 6820 6120
1250420 7061 7274 6963 756c 6172 204b 6579 2028 6d75 6368 2062 6574 7465 7220 6d65 7468 6f64 730a 2520 2020 6578 6973 7429 2e20
1250500 2045 7863 6570 7420 666f 7220 6172 6775 6d65 6e74 206f 7264 6572 2c20 7468 6973 2069 7320 6964 656e 7469 6361 6c20 746f
1250560 2063 6f72 7265 7370 6f6e 642f 342c 0a25 2020 2062 7574 2073 656c 6563 7463 686b 2f34 2069 7320 6120 6d65 6d62 6572 206f
1250640 6620 6120 636f 6865 7265 6e74 2066 616d 696c 792e 2020 4e6f 7465 2074 6861 7420 7468 650a 2520 2020 6172 6775 6d65 6e74
1250720 7320 6172 6520 6c69 6b65 2074 6865 2061 7267 756d 656e 7473 206f 6620 6d65 6d62 6572 6368 6b2f 322c 2074 7769 6365 2e0a
1251000 0a73 656c 6563 7463 686b 2858 2c20 5b58 7c54 6169 6c5d 2c20 592c 205b 597c 5461 696c 5d29 203a 2d20 212e 0a73 656c 6563
1251060 7463 686b 2858 2c20 5b48 6561 647c 586c 6973 745d 2c20 592c 205b 4865 6164 7c59 6c69 7374 5d29 203a 2d0a 0973 656c 6563
1251140 7463 686b 2858 2c20 586c 6973 742c 2059 2c20 596c 6973 7429 2e0a 0a0a 0a25 2020 2073 686f 7274 6572 5f6c 6973 7428 5368
1251220 6f72 742c 204c 6f6e 6729 0a25 2020 2069 7320 7472 7565 2077 6865 6e20 5368 6f72 7420 6973 2061 206c 6973 7420 6973 2073
1251300 7472 6963 746c 7920 7368 6f72 7465 7220 7468 616e 204c 6f6e 672e 2020 4c6f 6e67 0a25 2020 2064 6f65 736e 2774 2068 6176
1251360 6520 746f 2062 6520 6120 7072 6f70 6572 206c 6973 7420 7072 6f76 6964 6564 2069 7420 6973 206c 6f6e 6720 656e 6f75 6768
1251440 2e20 2054 6869 730a 2520 2020 6361 6e20 6265 2075 7365 6420 746f 2067 656e 6572 6174 6520 6c69 7374 7320 7368 6f72 7465
1251520 7220 7468 616e 204c 6f6e 672c 206c 656e 6774 6873 2030 2c20 312c 2032 2e2e 2e0a 2520 2020 7769 6c6c 2062 6520 7472 6965
1251600 642c 2062 7574 2062 6163 6b74 7261 636b 696e 6720 7769 6c6c 2074 6572 6d69 6e61 7465 2077 6974 6820 6120 6c69 7374 2074
1251660 6861 7420 6973 0a25 2020 206f 6e65 2065 6c65 6d65 6e74 2073 686f 7274 6572 2074 6861 6e20 4c6f 6e67 2e20 2049 7420 6361
1251740 6e6e 6f74 2062 6520 7573 6564 2074 6f20 6765 6e65 7261 7465 206c 6973 7473 0a25 2020 206c 6f6e 6765 7220 7468 616e 2053
1252020 686f 7274 2c20 6265 6361 7573 6520 6974 2064 6f65 736e 2774 206c 6f6f 6b20 6174 2061 6c6c 2074 6865 2065 6c65 6d65 6e74
1252100 7320 6f66 2074 6865 0a25 2020 206c 6f6e 6765 7220 6c69 7374 2e0a 0a73 686f 7274 6572 5f6c 6973 7428 5b5d 2c20 5b5f 7c5f
1252160 5d29 2e0a 7368 6f72 7465 725f 6c69 7374 285b 5f7c 5368 6f72 745d 2c20 5b5f 7c4c 6f6e 675d 2920 3a2d 0a09 7368 6f72 7465
1252240 725f 6c69 7374 2853 686f 7274 2c20 4c6f 6e67 292e 0a09 0a0a 0a25 2020 2073 7562 7365 7128 5365 7175 656e 6365 2c20 5375
1252320 6253 6571 7565 6e63 652c 2043 6f6d 706c 656d 656e 7429 0a25 2020 2069 7320 7472 7565 2077 6865 6e20 5375 6253 6571 7565
1252400 6e63 6520 616e 6420 436f 6d70 6c65 6d65 6e74 2061 7265 2062 6f74 6820 7375 6273 6571 7565 6e63 6573 206f 6620 7468 650a
1252460 2520 2020 6c69 7374 2053 6571 7565 6e63 6520 2874 6865 206f 7264 6572 206f 6620 636f 7272 6573 706f 6e64 696e 6720 656c
1252540 656d 656e 7473 2062 6569 6e67 2070 7265 7365 7276 6564 290a 2520 2020 616e 6420 6576 6572 7920 656c 656d 656e 7420 6f66
1252620 2053 6571 7565 6e63 6520 7768 6963 6820 6973 206e 6f74 2069 6e20 5375 6253 6571 7565 6e63 6520 6973 2069 6e20 7468 650a
1252700 2520 2020 436f 6d70 6c65 6d65 6e74 2061 6e64 2076 6963 6520 7665 7273 612e 2020 5468 6174 2069 732c 0a25 2020 206c 656e
1252760 6774 6828 5365 7175 656e 6365 2920 3d20 6c65 6e67 7468 2853 7562 5365 7175 656e 6365 292b 6c65 6e67 7468 2843 6f6d 706c
1253040 656d 656e 7429 2c20 652e 672e 0a25 2020 2073 7562 7365 7128 5b31 2c32 2c33 2c34 5d2c 205b 312c 332c 345d 2c20 5b32 5d29
1253120 2e20 2054 6869 7320 7761 7320 7772 6974 7465 6e20 746f 2067 656e 6572 6174 6520 7375 6273 6574 730a 2520 2020 616e 6420
1253200 7468 6569 7220 636f 6d70 6c65 6d65 6e74 7320 746f 6765 7468 6572 2c20 6275 7420 6361 6e20 616c 736f 2062 6520 7573 6564
1253260 2074 6f20 696e 7465 726c 6561 7665 2074 776f 0a25 2020 206c 6973 7473 2069 6e20 616c 6c20 706f 7373 6962 6c65 2077 6179
1253340 732e 2020 4e6f 7465 2074 6861 7420 6966 2053 3120 6973 2061 2073 7562 7365 7420 6f66 2053 322c 2069 7420 7769 6c6c 0a25
1253420 2020 2062 6520 6765 6e65 7261 7465 6420 2a62 6566 6f72 6520 5332 2061 7320 6120 5375 6253 6571 7565 6e63 6520 616e 6420
1253500 2a61 6674 6572 2069 7420 6173 2061 2043 6f6d 706c 656d 656e 742e 0a0a 7375 6273 6571 285b 5d2c 205b 5d2c 205b 5d29 2e0a
1253560 7375 6273 6571 285b 4865 6164 7c54 6169 6c5d 2c20 5362 7371 2c20 5b48 6561 647c 436d 706c 5d29 203a 2d0a 0973 7562 7365
1253640 7128 5461 696c 2c20 5362 7371 2c20 436d 706c 292e 0a73 7562 7365 7128 5b48 6561 647c 5461 696c 5d2c 205b 4865 6164 7c53
1253720 6273 715d 2c20 436d 706c 2920 3a2d 0a09 7375 6273 6571 2854 6169 6c2c 2053 6273 712c 2043 6d70 6c29 2e0a 0a0a 0a25 2020
1254000 2073 7562 7365 7130 282b 5365 7175 656e 6365 2c20 3f53 7562 5365 7175 656e 6365 290a 2520 2020 6973 2074 7275 6520 7768
1254060 656e 2053 7562 5365 7175 656e 6365 2069 7320 6120 7375 6273 6571 7565 6e63 6520 6f66 2053 6571 7565 6e63 652c 2062 7574
1254140 206d 6179 0a25 2020 2062 6520 5365 7175 656e 6365 2069 7473 656c 662e 2020 2054 6875 7320 7375 6273 6571 3028 5b61 2c62
1254220 5d2c 205b 612c 625d 2920 6973 2074 7275 6520 6173 2077 656c 6c0a 2520 2020 6173 2073 7562 7365 7130 285b 612c 625d 2c20
1254300 5b61 5d29 2e20 2053 6571 7565 6e63 6520 6d75 7374 2062 6520 6120 7072 6f70 6572 206c 6973 742c 2073 696e 6365 0a25 2020
1254360 2074 6865 7265 2061 7265 2069 6e66 696e 6974 656c 7920 6d61 6e79 206c 6973 7473 2077 6974 6820 6120 6769 7665 6e20 5375
1254440 6253 6571 7565 6e63 652e 0a25 2020 203f 2d20 7365 746f 6628 582c 2073 7562 7365 7130 285b 612c 622c 635d 2c58 292c 2058
1254520 7329 2e0a 2520 2020 5873 203d 205b 5b5d 2c5b 615d 2c5b 612c 625d 2c5b 612c 622c 635d 2c5b 612c 635d 2c5b 625d 2c5b 622c
1254600 635d 2c5b 635d 5d20 0a25 2020 203f 2d20 6261 676f 6628 582c 2073 7562 7365 7130 285b 612c 622c 632c 645d 2c58 292c 2058
1254660 7329 2e0a 2520 2020 5873 2031 205b 5b61 2c62 2c63 2c64 5d2c 5b62 2c63 2c64 5d2c 5b63 2c64 5d2c 5b64 5d2c 5b5d 2c5b 635d
1254740 2c5b 622c 645d 2c5b 625d 2c5b 622c 635d 2c5b 612c 645d 2c0a 2509 2020 5b61 2c64 5d2c 5b61 5d2c 5b61 2c63 5d2c 5b61
1255020 2c62 2c64 5d2c 5b61 2c62 5d2c 5b61 2c62 2c63 5d5d 200a 0a73 7562 7365 7130 284c 6973 742c 204c 6973 7429 2e0a 7375 6273
1255100 6571 3028 4c69 7374 2c20 5265 7374 2920 3a2d 0a09 7375 6273 6571 3128 4c69 7374 2c20 5265 7374 292e 0a0a 0a25 2020 2073
1255160 7562 7365 7131 282b 5365 7175 656e 6365 2c20 3f53 7562 5365 7175 656e 6365 290a 2520 2020 6973 2074 7275 6520 7768 656e
1255240 2053 7562 5365 7175 656e 6365 2069 7320 6120 7072 6f70 6572 2073 7562 7365 7175 656e 6365 206f 6620 5365 7175 656e 6365
1255320 2c0a 2520 2020 7468 6174 2069 7320 6974 2063 6f6e 7461 696e 7320 6174 206c 6561 7374 206f 6e65 2065 6c65 6d65 6e74 206c
```

```
1255400  6573 732e 2020 5365 7175 656e 6365 206d 7573 740a 2520 2020 6265 2061 2070 726f 7065 7220 6c69 7374 2c20 6173 2053 7562
1255460  5365 7175 656e 6355 2064 6f65 7320 6e6f 7420 6465 7465 726d 696e 6520 5365 7175 656e 6365 2e0a 0a73 7562 7365 7131 285b
1255540  5f48 6561 647c 5461 696c 5d2c 2052 6573 7429 203a 2d0a 0973 7562 7365 7130 2854 6169 6c2c 2052 6573 000c 4108 0200 1d17
1255620  0000 473f 0000 0008 000d 6a74 000d 6a74 0001 0053 0000 0000 000d 441a 0500 1d17 0000 473f 0000 0014 000d 6b0c 000d 6b0c
1255700  0001 0053 0000 0000 ffff ffff 0400 47af 0000 473f 0000 0010 000d 6b80 000d 6b98 0001 0053 0000 0000 ffff ffff 0300 47b7
1255760  0000 473f 0000 000c 000d 6be8 000d 6be8 0001 0053 0000 0000 000d 4478 0400 47b7 0000 473f 0000 0010 000c 7984 000c 7984
1256040  0001 0053 0000 0000 0008 cb6c 0100 47bf 0000 473f 0000 00c4 000d 6d88 000d 6d88 0001 0053 0000 0000 ffff ffff 0300 47c7
1256120  0000 473f 0000 000c 000d 6e14 000d 6e14 0001 0053 0000 0000 0008 cb8c 0200 47cf 0000 473f 0000 0008 000d 6e48 000d 6e48
1256200  0001 0053 0000 0000 ffff ffff 0300 47d7 0000 473f 0000 000c 000d 6ef0 000d 6f04 0001 0053 0000 0000 ffff ffff 0300 47df
1256260  0000 473f 0000 000c 000d 6f28 000d 6f28 0001 0053 0000 0000 ffff ffff 0300 47e7 0000 473f 0000 000c 000c 7c80 000c 7c80
1256340  0001 0053 0000 0000 0000 47e7 b464 030b 000c 61b8 000d 2368 000d 4558 0400 47e7 0000 473f 0000 0010 000c 7e6c 000c 7e6c
1256420  0001 0053 0000 0000 ffff ffff 0300 47ef 0000 473f 0000 000c 000c 7dc4 000c 7dc4 0001 0053 0000 0000 0000 47ef b464 03a3
1256500  000c 6e20 000d 235c 000d 45a8 0400 47ef 0000 473f 0000 0010 000c 800c 000c 800c 0001 0053 0000 0000 ffff ffff 0200 47f7
1256560  0000 473f 0000 0008 000d 7110 000d 7110 0001 0053 0000 0000 0000 47f7 b328 039b 000c 6e88 0000 0000 000b acc4 0200 2b37
1256640  0000 473f 0000 0008 000d 715c 000d 715c 0001 0053 0000 0000 0000 2b37 b328 017b 000c 6ebc 0000 0000 ffff ffff 0400 47ff
1256720  0000 473f 0000 0010 000d 72c4 000d 72d4 0001 0053 0000 0000 0000 47ff b328 03ab 000c 6ef0 0000 0000 ffff ffff 0200 4807
1257000  0000 473f 0000 0008 000d 7238 000d 7238 0001 0053 0000 0000 0000 4807 b328 0373 000c 6f24 0000 0000 ffff ffff 0200 480f
1257060  0000 473f 0000 0008 000d 72f4 000d 72f4 0001 0053 0000 0000 0000 480f b328 038b 000c 6f58 0000 0000 0008 cbac 0200 4817
1257140  0000 473f 0000 0008 000d 7448 000d 7448 0001 0053 0000 0000 0000 4817 b328 0173 000c 6f8c 0000 0000 000a 3dd8 0000 0000
1257220  000d 4708 000d 4718 ffff ffff 0200 481f 0000 473f 0000 0008 000d 751c 000d 751c 0001 0053 0000 0000 0000 481f b328 031b
1257300  000c 6fc0 0000 0000 0008 cbec 0200 4827 0000 473f 0000 0008 000d 7468 000d 7468 0001 0053 0000 0000 0000 4827 b328 0313
1257360  000c 6ff4 0000 0000 000a 30ec 0000 0000 000d 4778 000d 4788 ffff ffff 0200 482f 0000 473f 0000 0008 000d 75dc 000d 75dc
1257440  0001 0053 0000 0000 0000 482f b464 034b 000c 7028 000d 2350 000d 4798 0300 482f 0000 473f 0000 000c 000c 8480 000c 8480
1257520  0001 0053 0000 0000 ffff ffff 0400 4837 0000 473f 0000 0010 000d 7778 000d 7790 0001 0053 0000 0000 0000 4837 b464 030b
1257600  000c 7090 000d 8404 0008 aa8c 0400 483f 0000 473f 0000 0010 000d 77bc 000d 77d4 0001 0053 0000 0000 0000 483f b464 3a8f
1257660  000c 70c4 000d 83f8 000a 3de8 0000 0000 000d 4838 000d 4848 ffff ffff 0200 4847 0000 473f 0000 0008 000d 7818 000d 7818
1257740  0001 0053 0000 0000 0000 4847 b328 030b 000c 70f8 0000 0000 0008 cc0c 0300 484f 0000 473f 0000 000c 000d 7884 000d 7884
1260020  0001 0053 0000 0000 0000 484f b328 2677 000c 712c 0000 0000 000b 16cc 0200 4857 0000 473f 0000 0008 000d 7900 000d 790c
1260100  0001 0053 0000 0000 0000 4857 b328 034b 000c 7160 0000 0000 000b 17a0 0200 485f 0000 473f 0000 0008 000d 7940 000d 7940
1260160  0001 0053 0000 0000 0000 485f b328 034b 000c 7194 0000 0000 ffff ffff 0200 4867 0000 473f 0000 0008 000d 79a8 000d 79a8
1260240  0001 0053 0000 0000 0000 4867 b328 017b 000c 71c8 0000 0000 ffff ffff 0200 486f 0000 473f 0000 0008 000c 87f4 000c 87f4
1260320  0001 0053 0000 0000 0000 486f b328 034b 000c 71fc 0000 0000 b464 80d8 0013 f314 0000 0000 0007 7374 7269 6e67 7300 0000
1260400  2aa8 3edc 0016 2168 0016 203c 0007 6367 656e 7379 6d00 4990 0009 6368 6172 5f61 746f 6d00 0006 636f 6e63 6174 000d 49a8
1260460  0009 6d69 6473 7472 696e 6700 0008 6e74 685f 6368 6172 00c0 0009 7370 616e 5f6c 6566 7400 0009 7370 616e 5f74 7269 6d00
1260540  0008 7375 6263 6361 7273 00e4 0009 7375 6273 7472 696e 6700 b464 4a18 0013 ebc4 0000 0000 b464 4d84 0013 ec60 0000 0000
1260620  b464 4a30 0013 e198 0000 0000 b464 731c 0013 ec34 0011 7318 b464 4d00 0013 ee9c 0000 0000 0009 6573 7469 6d61 746f 7200
1260700  0009 6368 6970 7369 7a65 7200 0006 6675 6e69 7473 000d 4a50 0008 7363 6865 6475 6c65 0000 2aa8 4a9c 000d 4a98 0013 a452
1260760  29c8 5dd0 0011 2140 0013 a3b6 2aa8 4a78 000d 4a74 0013 a43a 2aa8 4bec 000d 4be8 0013 a472 2aa8 4b08 000d 4b04 0013 a65a
1261040  0007 6765 6e5f 696e 7400 4aa4 0007 6765 6e5f 6e61 7400 4ab0 0007 6e75 6d6c 6973 7400 4abc 0008 636c 7573 7465 7273 0000
1261120  0008 6265 7477 6565 6e31 00a8 0008 6e75 6d6c 6973 7431 0068 0008 6e75 6d6c 6973 7432 00ec 2aa8 4b80 000d 4b7c 0013 a682
1261200  2aa8 4b98 000d 4b94 0013 a5ba 27f0 000c 0012 b254 48f8 228c 0007 7265 7065 6174 3100 4b1c 28c4 000a 0013 3500 228c 4b28
1261260  2b24 4b50 0002 438a 0013 35d2 29c8 4b5c 000d 4b40 0012 a3ce 2aa8 4c40 000d 4c3c 0013 a4d2 b464 4ad8 0012 a8a8 0014 8c78
1261340  2aa8 4c58 000d 4c54 0013 a6d2 2aa8 4b74 000d 4b70 0013 a6aa 2aa8 4aa8 000d 4aa4 0013 a632 2aa8 4c7c 000d 4c78 0013 a5e2
1261420  2aa8 4b14 000d 4b10 0013 a592 2aa8 4ba4 000d 4ba0 0013 a572 2aa8 4bb0 000d 4bac 0013 a552 2aa8 4bbc 000d 4bb8 0013 a532
1261500  2aa8 4bc8 000d 4bc4 0013 a512 2aa8 4b5c 000d 4b58 0013 a4b2 2aa8 4be0 000d 4bdc 0013 a492 0009 6d73 745f 636f 7374 7300
1261560  2aa8 4c4c 000d 4c48 0013 5af6 27f0 000c 0013 3a54 54a8 228c 0008 6469 7374 616e 6365 000c 0009 6469 7374 5f70 6169 7200
1261640  27f0 000c 0013 3d38 54a8 228c 2aa8 4bd4 000d 4bd0 0013 a4f2 2aa8 edb8 0010 e1b4 0013 5b26 2aa8 4ca0 000d 4c9c 0013 a6fa
1261720  29c8 4c58 000d 4c6c 0012 d31e 2b24 4c64 0002 438a 0013 7b4a 2aa8 4b8c 000d 4b98 0013 a60a 2aa8 4a90 000d 4a8c 0013 a422
1262000  0008 7365 6c66 5f64 7570 009c 2aa8 4c04 000d 4c00 0013 5ac6 0007 636c 7573 7465 7200 0000 0008 7061 7261 6c6c 656c 0000
1262060  0006 6170 6172 7479 000d 4ce4 2aa8 4cdc 000d 4cd8 0013 5b86 2b24 e610 0002 438a 0013 5bb6 0008 6663 6f73 742e 706c 0000
1262140  b464 4d78 0013 f10c 000d 4d74 b464 4d30 0013 eed0 0000 0000 29c8 4d00 000d 4d14 0013 ac76 2b24 4d0c 0002 438a 0014 0b0a
1262220  b464 4cf4 0013 f0a4 0000 0000 b464 e610 0013 efd4 0010 e60c 0006 6275 642e 706c 0000 0000 0006 6765 6e73 7964 0000 0000
1262300  0007 6465 7369 676e 7300 4d5c b464 3554 0014 16a0 0015 3550 0008 7374 6163 6b2e 706c 0000 b464 497c 0013 f140 0000 0000
1262360  b464 7370 0013 ecc8 0000 0000 0009 656e 7469 7479 5f69 6400 000d 84ec 0000 1be8 0010 d86c 0010 d844 0010 d778 0010 d734
1262440  0010 d704 0010 d68c 0000 0000 0000 0000 0000 0000 0000 0000 0000 0000 0000 0000 0000 0000 0010 d9cc 000d 4e9c 0000 00c0
```

```
1262520  0011 27e0 0011 27b0 0011 2670 0011 25f8 0011 2494 0011 23d8 0011 22ec 0010 ef98 0010 e7e8 0010 e55c 0010 e370 0010 dff8
1262600  0010 df34 0010 d3cc 0010 dac4 0010 da48 0010 d86c 0010 d844 0010 d778 0010 d734 0010 d704 0010 d68c 0000 0000 0000 0000
1262660  0000 0000 0000 0000 0000 0000 0000 0000 0000 0000 0000 0000 0000 0000 0000 0000 0000 0000 0000 0000 0000 0000 0000 0000
1262740  0000 0000 0000 0000 0000 0000 0000 0000 0000 0000 0000 0000 0000 0000 0000 0000 0000 0000 0000 0000 000d 84ec 0000 1ae8
1263020  2c5f 2c5f 2c5f 2c5f 2c5f 2c5f 2c5f 292c 2069 6428 702d 4e29 292e 0a70 726f 6362 6f64 795f 7479 7065 2870 726f 6362 6f64
1263100  7928 5f2c 542c 5f2c 5f2c 5f2c 5f2c 5f2c 5f2c 5f2c 5f2c 5f2c 5f2c 5f2c 5f29 2c20 5429 2e0a 7072 6f63 626f 6479 5f70 6172
1263160  656e 7428 7072 6f63 626f 6479 285f 2c5f 2c50 2c5f 2c5f 2c5f 2c5f 2c5f 2c5f 2c5f 2c5f 2c5f 2c5f 2c5f 292c 2050 292e 0a70
1263240  726f 6362 6f64 795f 6e61 6d65 2870 726f 6362 6f64 7928 5f2c 5f2c 5f2c 4e2c 5f2c 5f2c 5f2c 5f2c 5f2c 5f2c 5f2c 5f2c 5f2c
1263320  5f29 2c20 4e29 2e0a 7072 6f63 626f 6479 5f69 6e70 7574 7328 7072 6f63 626f 6479 285f 2c5f 2c5f 2c5f 2c49 2c5f 2c5f 2c5f
1263400  2c5f 2c5f 2c5f 2c5f 2c5f 2c5f 292c 2049 292e 0a70 726f 6362 6f64 795f 6f75 7470 7574 7328 7072 6f63 626f 6479 285f 2c5f
1263460  2c5f 2c5f 2c5f 2c4f 2c5f 2c5f 2c5f 2c5f 2c5f 2c5f 2c5f 2c5f 292c 204f 292e 0a70 726f 6362 6f64 795f 6f70 6572 6174 6f72
1263540  7328 7072 6f63 626f 6479 285f 2c5f 2c5f 2c5f 2c5f 2c5f 2c4f 2c5f 2c5f 2c5f 2c5f 2c5f 2c5f 2c5f 292c 204f 292e 0a70 726f
1263620  6362 6f64 795f 6361 6c6c 7328 7072 6f63 626f 6479 285f 2c5f 2c5f 2c5f 2c5f 2c5f 2c5f 2c43 2c5f 2c5f 2c5f 2c5f 2c5f 2c5f
1263700  292c 2043 292e 0a70 726f 6362 6f64 795f 6f70 6361 6c6c 7328 7072 6f63 626f 6479 285f 2c5f 2c5f 2c5f 2c5f 2c5f 2c5f 2c5f
1263760  2c4f 2c5f 2c5f 2c5f 2c5f 2c5f 292c 204f 292e 0a70 726f 6362 6f64 795f 636f 6e64 6974 696f 6e28 7072 6f63 626f 6479 285f
1264040  2c5f 2c5f 2c5f 2c5f 2c5f 2c5f 2c5f 2c5f 2c43 2c5f 2c5f 2c5f 2c5f 292c 2043 292e 0a70 726f 6362 6f64 795f 6174 7472 6962
1264120  7574 6573 2870 726f 6362 6f64 7928 5f2c 5f2c 5f2c 5f2c 5f2c 5f2c 5f2c 5f2c 5f2c 5f2c 412c 5f2c 5f2c 5f29 2c20 4129 2e0a
1264200  7072 6f63 626f 6479 5f73 7563 6365 7373 6f72 7328 5072 6f63 426f 6479 2c20 5375 6363 6573 736f 7273 2920 3a2d 0a09 7072
1264260  6f63 626f 6479 5f69 6428 5072 6f63 426f 6479 2c20 5072 6f63 426f 6479 4964 292c 0a09 7375 6363 6573 736f 7273 2850 726f
1264340  6342 6f64 7949 642c 2053 7563 6365 7373 6f72 7329 2e0a 7072 6f62 6f64 795f 7072 6564 6563 6573 736f 7273 2850 726f 6342
1264420  6f64 792c 2050 7265 6465 6365 7373 6f72 7329 203a 2d0a 0970 726f 6362 6f64 795f 6964 2850 726f 6342 6f64 792c 2050 726f
1264500  6342 6f64 7949 6429 2c0a 0970 7265 6465 6365 7373 6f72 7328 5072 6f63 426f 6479 4964 2c20 5072 6564 6563 6573 736f 7273
1264560  292e 0a70 726f 6362 6f64 795f 736f 7572 6365 5f6c 696e 655f 6e75 6d62 6572 2870 726f 6362 6f64 7928 5f2c 5f2c 5f2c 5f2c
1264640  5f2c 5f2c 5f2c 5f2c 5f2c 5f2c 5f2c 5f2c 5f2c 4c29 2c20 4c29 2e0a 0a70 726f 6362 6f64 795f 6e75 6d62 6572 2850 726f 6362
1264720  6f64 792c 204e 2920 3a2d 0a09 7072 6f63 626f 6479 5f69 6428 5072 6f63 626f 6479 2c20 6964 2870 2d4e 2929 2e0a 0a25 2525
1265000  2525 2525 2525 2525 2525 2525 2525 2525 2525 2525 2525 2525 2525 2525 2525 2525 2525 2525 2525 2525 2525 2525 2525 2525
1265060  2525 2525 2525 2525 2525 2525 2525 2525 2525 2525 2525 2525 2525 250a 3a2d 2064 796e 616d 6963 206f 7065 7261 746f 722f
1265140  3130 2e0a 250a 256f 7065 7261 746f 7228 4964 2c09 0909 2020 2025 2055 6e69 7175 6520 6964 0a25 0920 4f70 436f 6465 2c09
1265220  0920 2020 2520 6f70 6572 6174 6f72 0a25 0920 5479 7065 2c09 0909 2020 2025 2072 656d 6e61 6e74 7320 6672 6f6d 2049 5350
1265300  5320 2954 432c 204f 432c 5341 2c55 5329 0a25 0920 4361 6c6c 2c09 0909 2020 2025 206e 616d 6520 6f66 2070 726f 6365 6475
1265360  7265 206f 7220 626f 6479 2077 6520 6361 6c6c 2c0a 2509 0909 0920 2020 2520 7265 7374 6172 742c 2072 6573 756d 652c 206f
1265440  7220 6c65 6176 650a 2509 0909 0920 2020 2520 296e 6f74 2063 7572 7265 6e74 6c79 2075 7365 6429 0a25 0920 496e 7075 7473
1265520  2c09 0920 2020 2520 6c69 7374 206f 6620 696e 7075 7473 2074 6f20 7468 6520 6f70 6572 6174 6f72 0a25 0920 4f75 7470 7574
1265600  732c 0909 2020 2025 206c 6973 7420 6f66 206f 7574 7075 7473 2074 6f20 7468 6520 6f70 6572 6174 6f72 0a25 0920 4174 7472
1265660  6962 7574 6573 2c09 0920 2020 2520 6c69 7374 206f 6620 6174 7472 6962 7574 6573 0a25 0920 5061 7265 6e74 2c09 0920 2020
1265740  2520 6964 206f 6620 7061 7265 6e74 2062 6f64 7920 696e 2077 6869 6368 2074 6865 0a25 0909 0909 2020 2025 206f 7065 7261
1266020  746f 7220 6973 2064 6563 6c61 7265 640a 2509 2042 6974 7769 6474 6809 0920 2020 2520 6f70 6572 6174 6f72 2062 6974 2077
1266100  6964 7468 0a25 2009 2053 6f75 7263 655f 6c69 6e65 5f6e 756d 6265 7209 2020 2025 2073 6f75 7263 6520 6c69 6e65 206e 756d
1266160  6265 7220 2869 6620 6176 6169 6c61 626c 6529 0a25 2020 2020 2020 2020 2029 2e0a 250a 2520 4163 6365 7373 2046 756e 6374
1266240  696f 6e73 2066 6f72 206f 7065 7261 746f 7220 6669 656c 6473 2e0a 250a 6f70 6572 6174 6f72 286f 7065 7261 746f 7228 5f2c
1266320  5f2c 5f2c 5f2c 5f2c 5f2c 5f2c 5f2c 5f2c 5f29 292e 0a0a 6f70 6572 6174 6f72 5f69 6428 6f70 6572 6174 6f72 2869 6428 6f70
1266400  2d4e 2c50 6172 292c 5f2c 5f2c 5f2c 5f2c 5f2c 5f2c 5061 722c 5f2c 5f29 2c20 6964 286f 702d 4e2c 5061 7229 292e 0a6f 7065
1266460  7261 746f 725f 6f70 636f 6465 286f 7065 7261 746f 7228 5f2c 4f70 636f 6465 2c5f 2c5f 2c5f 2c5f 2c5f 2c5f 2c5f 2c5f 292c
1266540  204f 7063 6f64 6529 2e0a 6f70 6572 6174 6f72 5f74 7970 6528 6f70 6572 6174 6f72 285f 2c5f 2c54 7970 652c 5f2c 5f2c 5f2c
1266620  5f2c 5f2c 5f2c 5f29 2c20 5479 7065 292e 0a6f 7065 7261 746f 725f 6361 6c6c 286f 7065 7261 746f 7228 5f2c 5f2c 5f2c 4361
1266700  6c6c 2c5f 2c5f 2c5f 2c5f 2c5f 2c5f 292c 2043 616c 6c29 2e0a 6f70 6572 6174 6f72 5f69 6e70 7574 7328 6f70 6572 6174 6f72
1266760  285f 2c5f 2c5f 2c5f 2c49 6e70 7574 732c 5f2c 5f2c 5f2c 5f2c 5f29 2c20 496e 7075 7473 292e 0a6f 7065 7261 746f 725f 6f75
1267040  7470 7574 7328 6f70 6572 6174 6f72 285f 2c5f 2c5f 2c5f 2c5f 2c4f 7574 7075 7473 2c5f 2c5f 2c5f 2c5f 292c 204f 7574 7075
1267120  7473 292e 0a6f 7065 7261 746f 725f 6174 7472 6962 7574 6573 286f 7065 7261 746f 7228 5f2c 5f2c 5f2c 5f2c 5f2c 5f2c 4174
1267200  7472 6962 7574 6573 2c5f 2c5f 2c5f 292c 2041 7474 7269 6275 7465 7329 2e0a 6f70 6572 6174 6f72 5f70 6172 656e 7428 6f70
1267260  6572 6174 6f72 2869 6428 5f2c 5061 7265 6e74 292c 5f2c 5f2c 5f2c 5f2c 5f2c 5f2c 5061 7265 6e74 2c5f 2c5f 292c 2050 6172
1267340  656e 7429 2e0a 6f70 6572 6174 6f72 5f62 6974 7769 6474 6828 6f70 6572 6174 6f72 285f 2c5f 2c5f 2c5f 2c5f 2c5f 2c5f 2c5f
1267420  2c42 6974 7769 6474 682c 5f29 2c20 4269 7477 6964 7468 292e 0a6f 7065 7261 746f 725f 736f 7572 6365 5f6c 696e 655f 6e75
1267500  6d62 6572 286f 7065 7261 746f 7228 5f2c 5f2c 5f2c 5f2c 5f2c 5f2c 5f2c 5f2c 5f2c 4c29 2c20 4c29 2e0a 0a6f 7065 7261 746f
1267560  725f 6e75 6d62 6572 284f 7065 7261 746f 722c 204e 2920 3a2d 0a09 6f70 6572 6174 6f72 5f69 6428 4f70 6572 6174 6f72 2c20
```

| | | | | | | | | | | | | | | | | | | | | | | | | |
|---|---|---|---|---|---|---|---|---|---|---|---|---|---|---|---|---|---|---|---|---|---|---|---|---|
| 1267640 | 6964 | 286f | 702d | 4e2c | 5f29 | 292e | 0a0a | 250a | 2525 | 2525 | 2525 | 2525 | 2525 | 2525 | 2525 | 2525 | 2525 | 2525 | 2525 | 2525 | 2525 | 2525 | 2525 | 2525 |
| 1267720 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 0a3a |
| 1270000 | 2d20 | 6479 | 6e61 | 6169 | 6320 | 696f | 6e6f | 6465 | 2f31 | 302e | 0a25 | 0a25 | 696f | 6e6f | 6465 | 2d49 | 642c | 0909 | 0920 | 2020 | 2520 | 556e | 6971 | 7565 |
| 1270060 | 6c79 | 2069 | 6465 | 6e74 | 6966 | 6961 | 626c | 6520 | 6964 | 0a25 | 0954 | 7970 | 652c | 0909 | 0920 | 2020 | 2520 | 696e | 7075 | 7420 | 2870 | 726f | 6362 | 6f64 |
| 1270140 | 7920 | 696e | 7075 | 7429 | 207c | 0a25 | 0909 | 0909 | 2020 | 2025 | 206f | 7574 | 7075 | 7420 | 2870 | 726f | 6362 | 6f64 | 7920 | 6f75 | 7470 | 7574 | 290a | 2509 |
| 1270220 | 5661 | 7269 | 6162 | 6c65 | 5f69 | 642c | 0909 | 2020 | 2025 | 2069 | 6e69 | 7469 | 616c | 6c79 | 2066 | 726f | 6d20 | 7668 | 646c | 2028 | 6964 | 2869 | 6f2c | 6f70 |
| 1270300 | 2929 | 0a25 | 2020 | 2020 | 2020 | 2020 | 2020 | 2020 | 2020 | 2020 | 2020 | 2020 | 2020 | 2020 | 2020 | 2020 | 2020 | 2020 | 2020 | 2520 | 6f72 | 2028 | 6964 | 2876 |
| 1270360 | 6172 | 2c70 | 7229 | 290a | 2509 | 4269 | 7473 | 2c09 | 0909 | 2020 | 2025 | 206e | 7561 | 6265 | 7220 | 6f66 | 2062 | 6974 | 730a | 2509 | 4e61 | 6d65 | 2c09 | 0909 |
| 1270440 | 2020 | 2025 | 206e | 616d | 6520 | 6672 | 6f6d | 2076 | 6864 | 6c20 | 636f | 6d70 | 696c | 6572 | 0a25 | 0956 | 616c | 7565 | 2c09 | 0909 | 2020 | 2025 | 2076 | 616c |
| 1270520 | 7565 | 2069 | 6620 | 636f | 6e73 | 7461 | 6e74 | 0a25 | 0950 | 6172 | 656e | 744f | 702c | 0909 | 2020 | 2025 | 2070 | 6172 | 656e | 7420 | 6f70 | 6572 | 6174 | 6f72 |
| 1270600 | 2069 | 640a | 2509 | 5061 | 7265 | 6e74 | 5072 | 6f63 | 2c09 | 0920 | 2020 | 2520 | 7061 | 7265 | 6e74 | 2070 | 726f | 6362 | 6f64 | 7920 | 6964 | 0a25 | 0941 | 7474 |
| 1270660 | 7269 | 6275 | 7465 | 7309 | 0920 | 2020 | 2520 | 6c69 | 7374 | 203a | 2065 | 672e | 2066 | 6f72 | 6d61 | 6c20 | 7c20 | 636f | 6e73 | 7461 | 6e74 | 0a25 | 0953 | 6f75 |
| 1270740 | 7263 | 655f | 6c69 | 6e65 | 5f6e | 756d | 6265 | 7209 | 2020 | 2025 | 2073 | 6f75 | 7263 | 6520 | 6c69 | 6e65 | 206e | 756d | 6265 | 7220 | 2869 | 6620 | 6176 | 6169 |
| 1271020 | 6c61 | 626c | 6529 | 0a25 | 2020 | 2020 | 292e | 0a25 | 0a25 | 2041 | 6363 | 6573 | 7320 | 4675 | 6e63 | 7469 | 6f6e | 7320 | 666f | 7220 | 696f | 6e6f | 6465 | 2066 |
| 1271100 | 6965 | 6c64 | 732e | 0a25 | 0a69 | 6f6e | 6f64 | 6528 | 696f | 6e6f | 6465 | 285f | 2c5f | 2c5f | 2c5f | 2c5f | 2c5f | 2c5f | 2c5f | 2c5f | 2c5f | 2929 | 2e0a | 0a69 |
| 1271160 | 6f6e | 6f64 | 655f | 6964 | 2869 | 6f6e | 6f64 | 6528 | 6964 | 2869 | 6f2d | 4e2c | 4f70 | 292c | 5f2c | 5f2c | 5f2c | 5f2c | 5f2c | 4f70 | 2c5f | 2c5f | 2c5f | 292c |
| 1271240 | 2069 | 6428 | 696f | 2d4e | 2c4f | 7029 | 292e | 0a69 | 6f6c | 6f64 | 655f | 7479 | 7065 | 2869 | 6f6e | 6f64 | 6528 | 5f2c | 5479 | 7065 | 2c5f | 2c5f | 2c5f | 2c5f |
| 1271320 | 2c5f | 2c5f | 2c5f | 2c5f | 292c | 2054 | 7970 | 6529 | 2e0a | 696f | 6e6f | 6465 | 5f76 | 6172 | 6961 | 626c | 655f | 6964 | 2869 | 6f6e | 6f64 | 6528 | 5f2c | 5f2c |
| 1271400 | 5661 | 7269 | 6162 | 6c65 | 5f69 | 642c | 5f2c | 5f2c | 5f2c | 5f2c | 5f2c | 5f2c | 5f29 | 2c20 | 5661 | 7269 | 6162 | 6c65 | 5f69 | 6429 | 2e0a | 696f | 6e6f | 6465 |
| 1271460 | 5f62 | 6974 | 7328 | 696f | 6e6f | 6465 | 285f | 2c5f | 2c5f | 2c42 | 6974 | 732c | 5f2c | 5f2c | 5f2c | 5f2c | 5f2c | 5f29 | 2c20 | 4269 | 7473 | 292e | 0a69 | 6f6e |
| 1271540 | 6f64 | 655f | 6e61 | 6165 | 2869 | 6f6e | 6f64 | 6528 | 5f2c | 5f2c | 5f2c | 5f2c | 4e61 | 6d65 | 2c5f | 2c5f | 2c5f | 2c5f | 2c5f | 292c | 204e | 616d | 6529 | 2e0a |
| 1271620 | 696f | 6e6f | 6465 | 5f76 | 616c | 7565 | 2869 | 6f6e | 6f64 | 6528 | 5f2c | 5f2c | 5f2c | 5f2c | 5f2c | 5661 | 6c75 | 652c | 5f2c | 5f2c | 5f2c | 5f29 | 2c20 | 5661 |
| 1271700 | 6c75 | 6529 | 2e0a | 696f | 6e6f | 6465 | 5f70 | 6172 | 656e | 746f | 7028 | 696f | 6e6f | 6465 | 2869 | 6428 | 5f2c | 4f70 | 292c | 5f2c | 5f2c | 5f2c | 5f2c | 5f2c |
| 1271760 | 4f70 | 2c5f | 2c5f | 2c5f | 292c | 204f | 7029 | 2e0a | 696f | 6e6f | 6465 | 5f70 | 6172 | 656e | 7470 | 726f | 6328 | 696f | 6e6f | 6465 | 285f | 2c5f | 2c5f | 2c5f |
| 1272040 | 2c5f | 2c5f | 2c5f | 2c50 | 726f | 632c | 5f2c | 5f29 | 2c20 | 5072 | 6f63 | 292e | 0a69 | 6f6e | 6f64 | 655f | 6174 | 7472 | 6962 | 7574 | 6573 | 2869 | 6f6e | 6f64 |
| 1272120 | 6528 | 5f2c | 5f2c | 5f2c | 5f2c | 5f2c | 5f2c | 5f2c | 4174 | 7472 | 6962 | 7574 | 6573 | 2c5f | 292c | 2041 | 7474 | 7269 | 6275 | 7465 | 7329 | 2e0a | 696f | 6e6f |
| 1272200 | 6e6f | 6465 | 5f73 | 6f75 | 7263 | 655f | 6c69 | 6e65 | 5f6e | 756d | 6265 | 7228 | 696f | 6e6f | 6465 | 285f | 2c5f | 2c5f | 2c5f | 2c5f | 2c5f | 2c5f | 2c5f | 2c5f |
| 1272260 | 2c4c | 292c | 204c | 292e | 0a0a | 696f | 6e6f | 6465 | 5f6e | 756d | 6265 | 7228 | 494f | 6e6f | 6465 | 2c20 | 4e29 | 203a | 2d0a | 0969 | 6f6e | 6f64 | 655f | 6964 |
| 1272340 | 2849 | 4f6e | 6f64 | 652c | 2069 | 6428 | 696f | 2d4e | 2c5f | 2929 | 2e0a | 250a | 2525 | 2525 | 2525 | 2525 | 2525 | 2525 | 2525 | 2525 | 2525 | 2525 | 2525 | 2525 |
| 1272420 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 1272500 | 2525 | 2525 | 2525 | 0a3a | 2d20 | 6479 | 6e61 | 6d69 | 6320 | 7661 | 7269 | 6162 | 6c65 | 2f36 | 2e0a | 250a | 2576 | 6172 | 6961 | 626c | 6528 | 4964 | 2c09 | 0909 |
| 1272560 | 2020 | 2025 | 2055 | 6e69 | 7175 | 656c | 7920 | 6964 | 656e | 7469 | 6669 | 6162 | 6c65 | 2069 | 640a | 2509 | 5479 | 7065 | 2c09 | 0909 | 2020 | 2025 | 2065 | 6720 |
| 1272640 | 696e | 7465 | 6765 | 722c | 2062 | 6974 | 5f76 | 6563 | 746f | 7220 | 6574 | 632e | 0a25 | 0944 | 6563 | 6c61 | 7261 | 7469 | 6f6e | 5f74 | 7970 | 652c | 0920 | 2020 |
| 1272720 | 2520 | 666f | 726d | 616c | 2c20 | 6c6f | 6361 | 6c0a | 2520 | 2020 | 2020 | 2020 | 5061 | 7265 | 6e74 | 2c09 | 0909 | 2020 | 2025 | 2069 | 6420 | 6f66 | 2070 | 726f |
| 1273000 | 6362 | 6f64 | 7920 | 6465 | 636c | 6172 | 6564 | 2069 | 6e0a | 2509 | 4e61 | 6d65 | 0909 | 0920 | 2020 | 2520 | 6e61 | 6d65 | 2066 | 726f | 6d20 | 7668 | 646c | 2063 |
| 1273060 | 6f6d | 7069 | 6c65 | 720a | 2509 | 536f | 7572 | 6365 | 5f6c | 696e | 655f | 6e75 | 6d62 | 6572 | 0920 | 2020 | 2520 | 736f | 7572 | 6365 | 206c | 696e | 6520 | 6e75 |
| 1273140 | 6d62 | 6572 | 2028 | 6966 | 2061 | 7661 | 696c | 6162 | 6c65 | 290a | 2509 | 292e | 0a25 | 0a25 | 2041 | 6363 | 6573 | 7320 | 4675 | 6e63 | 7469 | 6f6e | 7320 | 666f |
| 1273220 | 7220 | 7661 | 7269 | 6162 | 6c65 | 2066 | 6965 | 6c64 | 730a | 250a | 7661 | 7269 | 6162 | 6c65 | 2876 | 6172 | 6961 | 626c | 6528 | 5f2c | 5f2c | 5f2c | 5f2c | 5f2c |
| 1273300 | 5f29 | 292e | 0a0a | 7661 | 7269 | 6162 | 6c65 | 5f69 | 6428 | 7661 | 7269 | 6162 | 6c65 | 2869 | 6428 | 762d | 4e2c | 5061 | 7265 | 6e74 | 292c | 5f2c | 5f2c | 5061 |
| 1273360 | 7265 | 6e74 | 2c5f | 2c5f | 292c | 2069 | 6428 | 762d | 4e2c | 5061 | 7265 | 6e74 | 2929 | 2e0a | 7661 | 7269 | 6162 | 6c65 | 5f74 | 7970 | 6528 | 7661 | 7269 | 6162 |
| 1273440 | 6c65 | 285f | 2c54 | 7970 | 652c | 5f2c | 5f2c | 5f2c | 5f29 | 2c20 | 5479 | 7065 | 292e | 0a76 | 6172 | 6961 | 626c | 655f | 6465 | 636c | 6172 | 6174 | 696f | 6e5f |
| 1273520 | 7479 | 7065 | 2876 | 6172 | 6961 | 626c | 6528 | 5f2c | 5f2c | 4465 | 636c | 5f74 | 7970 | 652c | 5f2c | 5f2c | 5f29 | 2c20 | 4465 | 636c | 5f74 | 7970 | 6529 | 2e0a |
| 1273600 | 7661 | 7269 | 6162 | 6c65 | 5f70 | 6172 | 656e | 7428 | 7661 | 7269 | 6162 | 6c65 | 2869 | 6428 | 5f2c | 5061 | 7265 | 6e74 | 292c | 5f2c | 5f2c | 5061 | 7265 | 6e74 |
| 1273660 | 2c5f | 2c5f | 292c | 2050 | 6172 | 656e | 7429 | 2e0a | 7661 | 7269 | 6162 | 6c65 | 5f6e | 616d | 6528 | 7661 | 7269 | 6162 | 6c65 | 285f | 2c5f | 2c5f | 2c5f | 2c4e |
| 1273740 | 616d | 652c | 5f29 | 2c20 | 4e61 | 6d65 | 292e | 0a76 | 6172 | 6961 | 626c | 655f | 736f | 7572 | 6365 | 5f6c | 696e | 655f | 6e75 | 6d62 | 6572 | 2876 | 6172 | 6961 |
| 1274020 | 626c | 6528 | 5f2c | 5f2c | 5f2c | 5f2c | 5f2c | 4c29 | 2c20 | 4c29 | 2e0a | 0a76 | 6172 | 6961 | 626c | 655f | 6e75 | 6d62 | 6572 | 2856 | 6172 | 6961 | 626c | 652c |
| 1274100 | 204e | 2920 | 3a2d | 0a0a | 7661 | 7269 | 6162 | 6c65 | 5f69 | 6428 | 5661 | 7269 | 6162 | 6c65 | 2c20 | 6964 | 2876 | 2d4e | 2c5f | 2929 | 2e0a | 250a | 2525 | 2525 |
| 1274160 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 1274240 | 2525 | 2525 | 2525 | 2525 | 2525 | 2525 | 2525 | 2525 | 2525 | 2525 | 2525 | 2525 | 2525 | 0a3a | 2d20 | 6479 | 6e61 | 6d69 | 6320 | 7479 | 7065 | 2f39 | 2e0a | 250a |
| 1274320 | 2574 | 7970 | 6528 | 2020 | 204e | 616d | 652c | 0909 | 0920 | 2020 | 2520 | 6e61 | 6d65 | 206f | 6620 | 7468 | 6520 | 7479 | 7065 | 0a25 | 0941 | 7474 | 7269 | 6275 |
| 1274400 | 7465 | 2c09 | 0920 | 2020 | 2520 | 7363 | 616c | 6172 | 7c20 | 636f | 6d70 | 6f73 | 6974 | 6520 | 7c20 | 6163 | 6365 | 7373 | 207c | 2066 | 696c | 650a | 2509 | 0909 |
| 1274460 | 0920 | 2020 | 2520 | 4e6f | 7465 | 2061 | 6363 | 6573 | 7320 | 2620 | 6669 | 6c65 | 2074 | 7970 | 6573 | 206e | 6f74 | 2073 | 7570 | 706f | 7274 | 6564 | 0a25 | 0953 |
| 1274540 | 7562 | 5f61 | 7474 | 7269 | 6275 | 7465 | 2c09 | 0920 | 2020 | 2520 | 656e | 756d | 6572 | 6174 | 696f | 6e7c | 696e | 7465 | 6765 | 727c | 7068 | 7973 | 6963 | 616c |
| 1274620 | 7c66 | 6c6f | 6174 | 202d | 7363 | 616c | 6172 | 0a25 | 0909 | 0909 | 2020 | 2025 | 2061 | 7272 | 6179 | 7c72 | 6563 | 6f72 | 6420 | 666f | 7220 | 636f | 6d70 | 6f73 |
| 1274700 | 6974 | 6520 | 7479 | 7065 | 730a | 2509 | 0909 | 0920 | 2020 | 2520 | 4e6f | 7465 | 2070 | 6879 | 7369 | 6361 | 6c2c | 666c | 6f61 | 742c | 7265 | 636f | 7264 | 206e |

```
1274760  6f74 2073 7570 706f 7274 6564 0a25 094c 6f77 2c09 0909 2020 2025 206c 6f77 2076 616c 7565 2066 6f72 2073 6361 6c61 7220
1275040  7479 7065 730a 2509 4869 6768 2c09 0909 2020 2025 2068 6967 6820 7661 6c75 6520 666f 7220 7363 616c 6172 2074 7970 6573
1275120  0a25 0956 616c 7565 732c 0909 0920 2020 2520 6c69 7374 206f 6620 7661 6c75 6573 2069 6620 656e 756d 6572 6174 696f 6e20
1275200  7479 7065 0a25 0942 6974 7769 6474 682c 0909 2020 2025 206e 756d 6265 7220 6f66 2062 6974 7320 2863 6f6d 7075 7465 6420
1275260  6966 206e 6563 6573 7361 7279 290a 2509 5375 6274 7970 6509 0909 2020 2025 2073 7562 7479 7065 206e 616d 6520 6966 2063
1275340  6f6d 706f 7369 7465 0a25 0953 6f75 7263 655f 6c69 6e65 5f6e 756d 6265 7209 2020 2025 2073 6f75 7263 6520 6c69 6e65 206e
1275420  756d 6265 7220 2869 6620 6176 6169 6c61 626c 6529 0a25 2020 2020 292e 0a25 0a25 2041 6363 6573 7320 4675 6e63 7469 6f6e
1275500  7320 666f 7220 7479 7065 2066 6965 6c64 732e 0a25 0a74 7970 6528 7479 7065 285f 2c5f 2c5f 2c5f 2c5f 2c5f 2c5f 2c5f 2c5f
1275560  2929 2e0a 0a74 7970 655f 6e61 6d65 2874 7970 6528 4e61 6d65 2c5f 2c5f 2c5f 2c5f 2c5f 2c5f 2c5f 2c5f 292c 204e 616d 6529
1275640  2e0a 7479 7065 5f61 7474 7269 6275 7465 2874 7970 6528 5f2c 4174 7472 6962 7574 652c 5f2c 5f2c 5f2c 5f2c 5f2c 5f2c 5f29
1275720  2c20 4174 7472 6962 7574 6529 2e0a 7479 7065 5f73 7562 5f61 7474 7269 6275 7465 2874 7970 6528 5f2c 5f2c 5375 625f 6174
1276000  7472 6962 7574 652c 5f2c 5f2c 5f2c 5f2c 5f2c 5f29 2c20 5375 625f 6174 7472 6962 7574 6529 2e0a 7479 7065 5f6c 6f77 2874
1276060  7970 6528 5f2c 5f2c 5f2c 4c6f 772c 5f2c 5f2c 5f2c 5f29 2c20 4c6f 7729 2e0a 7479 7065 5f68 6967 6828 7479 7065 285f
1276140  2c5f 2c5f 2c5f 2c48 6967 682c 5f2c 5f2c 5f2c 5f29 2c20 4869 676d 292e 0a74 7970 655f 7661 6c75 6573 2874 7970 6528 5f2c
1276220  5f2c 5f2c 5f2c 5f2c 5661 6c75 6573 2c5f 2c5f 2c5f 292c 2056 616c 7565 7329 2e0a 7479 7065 5f62 6974 7769 6474 6828 7479
1276300  7065 285f 2c5f 2c5f 2c5f 2c5f 2c5f 2c42 6974 7769 6474 682c 5f2c 5f29 2c20 4269 7477 6964 7468 292e 0a74 7970 655f 7375
1276360  6274 7970 6528 7479 7065 285f 2c5f 2c5f 2c5f 2c5f 2c5f 2c53 7562 7479 7065 2c5f 292c 2053 7562 7479 7065 292e 0a74
1276440  7970 655f 736f 7572 6365 5f6c 696e 655f 6e75 6d62 6572 2874 7970 6528 5f2c 5f2c 5f2c 5f2c 5f2c 5f2c 5f2c 4c29 2c20
1276520  4c29 2e0a 250a 2525 2525 2525 2525 2525 2525 2525 2525 2525 2525 2525 2525 2525 2525 2525 2525 2525 2525 2525 2525
1276600  2525 2525 2525 2525 2525 2525 2525 2525 2525 2525 2525 2525 2525 2525 2525 2525 2525 2525 0a3a 2d20 6479 6e61 6d69 6320
1276660  636f 6e73 7461 6e74 732f 372e 0a25 636f 6e73 7461 6e74 7328 4964 2c09 0909 2020 2025 2055 6e69 7175 656c 7920 6964 656e
1276740  7469 6669 6162 6c65 2069 640a 2509 5479 7065 2c09 0909 2020 2025 2074 7970 6520 6966 2061 7070 6c69 6361 626c 650a 2509
1277020  4e61 6d65 2c09 0909 2020 2025 206e 616d 6520 6966 2061 6e79 0a25 0956 616c 7565 2c09 0909 2020 2025 2063 6f6e 7374 616e
1277100  7420 7661 6c75 650a 2509 4269 7473 2c09 0909 2020 2025 206e 756d 6265 7220 6f66 2062 6974 730a 2509 5061 7265 6e74 2c09
1277160  0909 2020 2025 2069 6420 6f66 2070 726f 6362 6f64 7920 6465 636c 6172 6564 2069 6e0a 2509 536f 7572 6365 5f6c 696e 655f
1277240  6e75 6d62 6572 0920 2020 2520 736f 7572 6365 206c 696e 6520 6e75 6d62 6572 2028 6966 2061 7661 696c 6162 6c65 290a 2520
1277320  2020 2029 2e0a 250a 2520 4163 6365 7373 2066 756e 6374 696f 6e73 2066 6f72 2063 6f6e 7374 616e 7473 2066 6965 6c64 730a
1277400  636f 6e73 7461 6e74 2863 6f6e 7374 616e 7473 285f 2c5f 2c5f 2c5f 2c5f 2c5f 2c5f 2929 2e0a 0a63 6f6e 7374 616e 745f 6964
1277460  2863 6f6e 7374 616e 7473 2869 6428 632d 412c 5061 7265 6e74 292c 5f2c 5f2c 5f2c 5f2c 5f2c 5061 7265 6e74 2c5f 292c 2069 6428
1277540  632d 412c 5061 7265 6e74 2929 2e0a 636f 6e73 7461 6e74 5f6e 616d 6528 636f 6e73 7461 6e74 7328 5f2c 4e61 6d65 2c5f 2c5f
1277620  2c5f 2c5f 2c5f 292c 204e 616d 6529 2e0a 636f 6e73 7461 6e74 5f76 616c 7565 2863 6f6e 7374 616e 7473 285f 2c5f 2c56 616c
1277700  7565 2c5f 2c5f 2c5f 2c5f 292c 2056 616c 7565 292e 0a63 6f6e 7374 616e 745f 6269 7473 2863 6f6e 7374 616e 7473 285f 2c5f
1277760  2c5f 2c42 6974 732c 5f2c 5f2c 5f29 2c20 4269 7473 292e 0a63 6f6e 7374 616e 745f 7479 7065 2863 6f6e 7374 616e 7473 285f
1300040  2c5f 2c5f 2c5f 2c54 7970 652c 5f2c 5f29 2c20 5479 7065 292e 0a63 6f6e 7374 616e 745f 7061 7265 6e74 2863 6f6e 7374 616e
1300120  7473 2869 6428 5f2c 5061 7265 6e74 292c 5f2c 5f2c 5f2c 5f2c 5061 7265 6e74 2c5f 292c 2050 6172 656e 7429 2e0a 636f 6e73
1300200  7461 6e74 5f73 6f75 7263 655f 6c69 6e65 5f6e 756d 6265 7228 636f 6e73 7461 6e74 7328 5f2c 5f2c 5f2c 5f2c 5f2c 5f2c 4c29
1300260  2c20 4c29 2e0a 0a63 6f6e 7374 616e 745f 6e75 6d62 6572 2843 6f6e 7374 616e 742c 204e 2920 3a2d 0a09 636f 6e73 7461 6e74
1300340  5f69 6428 436f 6e73 7461 6e74 2c20 6964 0000 2ecf b328 7260 000c 7264 0000 0000 001f 2240 2823 2938 392f 3132 2f32 3720
1300420  6c69 7374 732e 706c 2020 2020 3336 2e31 2200 69b6 000c e98c 0100 2def 0000 473f 0000 0004 000d 6a1c 000d 6a1c 0001 0053
1300500  0000 0000 000a 6f72 5f74 6f5f 6c69 7374 0000 0000 0000 0028 000c e9b4 b27c b66c 0000 032e 7fff ffff 000d c814 0200 0db5
1300560  0100 32b5 0000 473f 0000 315f 0000 473f b328 6a16 000d 69f0 0000 0000 2cac 03a3 0002 438a 2ca0 03ab 0000 0000 0000 0001
1300640  000d 1820 000d 1820 0002 438a 000d 109c 0006 696e 7365 7274 000d 6a4e 000b 7361 6d65 206c 656e 6774 6800 6a5e 000d 6c69
1300720  7374 5f74 6f5f 7469 6d65 7300 0005 7365 7465 7100 2cac 034b 0002 438a 2ca0 0313 0000 0004 0000 0002 000d 1840 000d 6ac4
1301000  000d 6ace 000d 6aac 28c4 0014 000d 6ac4 4e1c 0000 0000 0007 54a8 228c 000d 6abd 0000 0000 000d 184c 0000 0000 000d 6aa4
1301060  000d 6ab4 2954 0024 0002 438a 56f8 671c 682c 3640 332c 247c 000b 0848 0014 3d30 2420 0000 000d 4428 0008 6663 6569 6c69
1301140  6e67 0020 27f0 0018 000d 6b30 4e1c 0000 0000 0007 4960 4a48 0018 228c 2cac 6b0c 0002 438a 2ca0 6b14 0000 0000 0000 0001
1301220  000d 6af4 000d 6b30 000d 6b3a 000d 2cbc 2954 0028 0002 438a 56f8 6580 001c 57b8 6c84 001c 6784 5878 0018 6c84 001c 67ec
1301300  0018 22bc 000d 4448 0000 4a67 b328 6b62 000d d954 0000 0000 000d 6d65 6d62 6572 6368 6b5f 616c 6c00 000a 3e68 0000 0000
1301360  27f0 0018 000d 6b98 5758 6b48 5fa0 57b8 671c 5fa0 49a8 2edc 2954 001c 0002 438a 5758 5fa0 6750 57b8 5fa0 6784 239c 0000
1301440  000d 4468 2954 0010 0002 438a 57b8 6b48 6b88 228c 000d 6ce8 0000 0000 000d 6d29 0000 0000 27f0 0014 000d 6c10 4e1c 0000
1301520  0000 0ad7 3050 c5a8 2cac 0abf 0002 438a 2ca0 1d8f 0000 0004 0000 0002 000d 6bd4 000d 6c54 000d 6c74 000d 6c24 000d 6e08
1301600  28c4 0014 000d 6c3c 4e1c 0000 0000 0007 54f8 228c 000d 6c35 0000 0000 000d 6be0 0000 0000 000d 6c1c 000d 6c2c 28c4 0018
1301660  000d 6c54 56f8 6420 4928 3050 3600 22bc 000d 4488 2954 0014 0002 438a 56f8 76b0 239c 0000 000d 4488 2b24 0abf 0002 438a
1301740  000d 6c5e 29c8 3a77 000d 6c68 000d 6c46 b464 8294 000e 2350 0000 0000 ffff ffff 0400 487f 0000 473f 0000 0010 000d 6cf0
1302020  000d 6cf0 0001 0053 0000 0000 000d 7469 6d65 735f 746f 5f6c 6973 7400 000b 1b34 0300 48a7 0000 473f 0000 000c 000c 7d58
```

```
1302100  000c 7d58 0001 0053 0000 0000 27f0 0014 000d 6d14 4e1c 0000 0000 0ad7 3050 c5a8 2cac 0a7f 0002 438a 2ca0 32bf 0000 0004
1302160  0000 0002 000d 6cdc 000d 6d30 000d 6d58 000d 6bcc 28c4 0014 000c 7a50 4e1c 0000 0000 0007 5548 228c 000d 6d20 000d 6bc4
1302240  2954 001c 0002 438a 56f8 6580 0018 5818 6c84 0018 67b8 22bc 000d 6c9c 2b24 33e7 0002 438a 000d 6d3a 29c8 315f 000d 6d4c
1302320  000c 7a5a 0005 6e74 6830 6900 0005 6e74 6830 7600 27f0 0014 000d 6dac 4e1c 0000 0000 0ad7 3050 c5a8 2cac 0c7b 0002 438a
1302400  2ca0 6bba 0000 0004 0000 0002 000d 6d74 000d 6dd8 000d 6de2 000d 6dc0 28c4 0012 000d 6dd8 4e1c 0000 0000 0007 228c 33e7
1302460  000d 6dd1 0000 0000 000d 6d80 0000 0000 000d 6db8 000d 6dc8 2954 0014 0002 438a 56f8 5fa0 671c 22bc 000d 44c8 000d 696e
1302540  7465 7273 6563 7469 6f6e 3100 27f0 0016 000c 7afc 4e1c 0000 0000 0007 54a8 54f8 228c 0abf 2cac 6bfa 0002 438a 2ca0 6e8a
1302620  0000 0000 0000 0001 000d 6dfc 000c 7afc 000c 7b06 000d 6c0c 000d 6465 6c5f 656c 656d 656e 745f 3100 2c78 0018 0002 438a
1302700  362c 5758 622c 359c 239c 0000 000d 6e70 000b 1934 0300 488f 0000 473f 0000 000c 000d 6ea4 000d 6ea4 0001 0053 0000 0000
1302760  0000 4747 b328 6c3a 000d c818 0000 0000 27f0 0014 000d 6ecc 4e1c 0000 0000 0007 4960 228c 2cac 6e91 0002 438a 2ca0 0db7
1303040  0000 0000 0000 0001 000d 6e90 000d 6ecc 000d 6ed6 000d 6ec8 000d 6e9c 2954 0014 0002 438a 56f8 6420 3600 22bc 000d 6e70
1303120  000c 6c69 7374 5f74 6f5f 706c 7573 0000 27f0 0014 000d 6f04 57b8 6b48 55f0 6b88 5fa0 228c 2954 0014 0002 438a 57b8 5fa0
1303200  6784 22bc 000d 4528 0000 4747 b328 0db7 000d 2958 0000 0000 2c78 0014 0002 438a 36b8 362c 359c 22bc 000d 45b8 0000 493f
1303260  b464 0c83 000d 28bc 000d 83ec 000b 1c0c 0400 48af 0000 473f 0000 0010 000d 6f90 000d 6f90 0001 0053 0000 0000 0000 492f
1303340  b328 32bf 000d 2954 0000 0000 27f0 0014 000d 6fb8 56f8 671c 5fa0 48f8 49c8 228c 2cac 6f99 0002 438a 2ca0 32bf 0000 0000
1303420  0000 0000 000d 6f7c 000d 6fb8 000d 6fe4 000d 6fb4 0000 0000 2954 0020 0002 438a 56f8 5fa0 671c bfcc a890 aaf0 0001 ac90
1303500  239c 0000 000d 6f5c 2b24 6d95 0002 438a 000d 6fc2 29c8 0007 000d 6fd8 000d 6f86 0000 4937 b328 6fea 000d 2888 0000 0000
1303560  0000 4927 b328 01b7 000d 2820 0000 0000 000a a51c 0000 0000 000d 7758 000a 35bc 0009 6674 7275 6e63 6174 6500 000d 6cbc
1303640  0400 48a7 0000 473f 0000 0010 000c 7f24 000c 7f24 0001 0053 0000 0000 000d 6f4c 0500 48af 0000 473f 0000 0014 000d 70a0
1303720  000d 70a0 0001 0053 0000 0000 b464 d82c 000e 558c 0000 0000 b464 d82c 000d d9c0 000a e60c 27f0 001a 000c 7fa8 56f8 6580
1304000  001c 4938 001c 49c8 4a00 0018 228c 39cf 2cac 70a0 0002 438a 2ca0 70a8 0000 0000 0000 0000 000d 7084 000c 7fa8 000d 70d4
1304060  000d 70c4 0000 0000 2b24 70c8 0002 438a 000c 7fb2 29c8 39cf 000d 70c8 000d 708e 0006 736f 6673 746b 0000 0000 0000 491f
1304140  b328 0ad7 000d 27ec 0000 0000 2c78 0014 0002 438a 56f8 5fa0 671c 22bc 000d 47a8 2cac fea3 0002 438a 2ca0 39cf 0000 0000
1304220  0000 0000 000d 70fc 000d 70fc 000d 7106 000d 7134 0000 0000 0000 4917 b328 004f 000d 27b8 0000 0000 27f0 0014 000d 7184
1304300  4e1c 0000 0000 0007 54a8 228c 2cac 3803 0002 438a 2ca0 3a67 0000 0000 0000 0001 000d 7148 000d 7184 000d 718e 000d 7180
1304360  000d 7154 2954 0028 0002 438a 56f8 6840 671c 4700 3310 247c 000d 4638 0018 386c 37f0 3cf4 242c 0000 000d 71bc 000b 19dc
1304440  0300 4897 0000 473f 0000 000c 000d 71dc 000d 7200 0001 0053 0000 0000 0000 490f b328 3fc3 000d 271c 0000 0000 27f0 0010
1304520  000d 7200 57b8 6b88 6b48 228c 2c78 0014 0002 438a 56f8 76b0 239c 0000 000d 71bc 2954 315f 0002 438a 2ca0 2167 0000 0000
1304600  0000 0000 000d 71ec 000d 71ec 000d 71f6 000d 7224 0000 0000 0000 4907 b328 004f 000d 26e8 0000 0000 2c78 0010 0002 438a
1304660  3640 22bc 000d 7258 000d 4688 0300 4807 0000 473f 0000 000c 000d 728c 000d 728c 0001 0053 0000 0000 2954 000a 0002 438a
1304740  228c 0000 27f0 0016 000c 81f4 4e1c 0000 0000 0007 54a8 54f8 228c 0007 2cac 32cf 0002 438a 2ca0 7294 0000 0000 0000 0001
1305020  000d 7274 000c 81f4 000c 81fe 000d 72b0 000d 7280 0000 48ff b328 72b8 000d 26b4 0000 0000 27f0 000e 000d 72d4 4950 49b8
1305100  228c 1d8f 2954 000e 0002 438a 4960 49a8 228c 138f 0000 48f7 b464 72e1 000d 264c 000d 8410 2c78 0018 0002 438a 3640 41e8
1305160  0000 0003 239c 0000 000d 731c 000d 46b8 0300 480f 0000 473f 0000 000c 000d 734c 000d 734c 0001 0053 0000 0000 29c8 836c
1305240  000d 8374 000d 2e9a 27f0 0014 000c 82cc 4e1c 0000 0000 0a87 3050 c5a8 2cac 7352 0002 438a 2ca0 7362 0000 0004 0000 0002
1305320  000d 7338 000d 7404 000d 73a4 000c 7b10 000d 74b4 28c4 0022 000d 73b0 56f8 5fa0 55f0 5fa0 55f0 5fa0 5370 3050 a874 aaf0
1305400  0003 aee8 7220 2e7f 2aa8 7391 000d 7310 000d 737e 29c8 73b2 000d 7398 000c 82d6 28c4 001e 000d 73dc 56f8 5fa0 55f0 5fa0
1305460  5370 3050 a874 aaf0 0002 aee8 7220 73d2 2aa8 0abf 000d 73f8 000d 73ba 28c4 001a 000d 7404 56f8 5fa0 5370 3050 a874 aaf0
1305540  0001 aee8 7220 0a7f 2b24 73fe 0002 438a 000d 73e6 2954 0014 0002 438a 4e1c 0000 0000 0007 4960 228c 000d 7344 0000 0000
1305620  000d 7410 000d 7418 0000 48ef b464 0abf 000d 25e4 000d 841c 000d 75b8 000d 7770 000d 750c 000a 35cc 2c78 0010 0002 438a
1305700  239c 0000 0008 e2bc 0000 48e7 b328 0a7f 000d 25b0 0000 0000 2c78 0014 0002 438a 36a4 437c 239c 0000 000d 748c 000d 4758
1305760  0400 4827 0000 473f 0000 0010 000d 74c0 000d 74c0 0001 0053 0000 0000 2b24 8390 0002 438a 000d cd3a 27f0 0016 000d 74e4
1306040  4e1c 0000 0000 0007 54a8 49c8 228c 74c5 2cac 315f 0002 438a 2ca0 2817 0000 0000 0000 0001 000d 74a8 000d 74e4 000d 74ee
1306120  000d 7370 2954 0028 0002 438a 56f8 6580 001c 5758 5fa0 6750 3724 0018 4568 6c84 001c 6c48 0018 22bc 000d 748c 0000 48df
1306200  b328 732a 000d 257c 0000 0000 2c78 0014 0002 438a 3640 4368 239c 0000 000d 7540 000d 4728 0300 481f 0000 473f 0000 000c
1306260  000d 7570 000d 7570 0001 0053 0000 0000 2b24 83a8 0002 438a 000d cb82 27f0 0014 000d 7598 4e1c 0000 0000 0007 4960 228c
1306340  2cac 0ab7 0002 438a 2ca0 32bf 0000 0000 0000 0001 000d 755c 000d 7598 000d 75a2 000d 7594 000d 7568 2954 0020 0002 438a
1306420  56f8 6580 0018 36a4 4550 6c84 0018 6c08 239c 0000 000d 7540 0000 48d7 b328 0007 000d 2548 0000 0000 27f0 0014 000d 7604
1306500  4e1c 0000 0000 0007 54a8 228c 2cac 0db7 0002 438a 2ca0 315f 0000 0000 0000 0001 000d 75c8 000d 7604 000d 760e 000d 7600
1306560  000d 75d4 2954 001c 0002 438a 56f8 5fa0 671c 5758 5fa0 6750 239c 0000 000d 47a8 2954 000a 0002 438a 228c 0000 ffff ffff
1306640  0300 489f 0000 473f 0000 000c 000d 762c 000d 76c4 0001 0053 0000 0000 000d 762c 0400 489f 0000 473f 0000 0010 000d 770c
1306720  000d 770c 0001 0053 0000 0000 0000 48cf b328 2327 000d 2514 0000 0000 2938 001e 000d 76c4 4e1c 0000 0000 0003 3588 3050
1307000  54a8 4c70 0000 0007 7220 2327 27f0 0abf 000d 76c4 2ca0 73dc 0000 0000 0000 0001 000d 767c 000d 76c4 0002 438a 000d 76c0
1307060  000d 7688 2954 0024 0002 438a 5758 5fa0 6750 57b8 5fa0 6784 bfcc a858 aaf0 ffff ac08 22bc 000d 763c 0006 756e 696f 6e31
1307140  0000 0000 27f0 0016 000d 7734 4e1c 0000 0000 0007 54a8 49c8 228c 2327 2cac 0abf 0002 438a 2ca0 0ab7 0000 0000 0000 0001
```

```
1307220 000d 76f4 000d 7734 000d 773e 000d 7730 000d 7700 2954 0024 0002 438a 56f8 5fa0 671c 5758 5fa0 6750 bfcc a890 aaf0 0001
1307300 ac90 22bc 000d 765c 0000 48c7 b328 0ad7 000d 24e0 0000 0000 000d 766c 000d 6b78 000a 3e78 0000 0000 27f0 0016 000d 7790
1307360 5758 6b48 671c 5818 6bc8 6b74 228c 32bf 2954 001c 0002 438a 5758 65d0 0018 5818 6c84 0018 67b8 22bc 000d 47f8 0000 4747
1307440 b328 77a6 000d 24b4 0000 0000 27f0 0016 000d 77d4 5758 6b48 671c 5818 6bc8 6b74 2edc 0abf 2954 001c 0002 438a 5758 65d0
1307520 0018 5818 6c84 0018 67b8 22bc 000d 4828 0000 4787 b328 77e9 000d 2448 0000 0000 27f0 0016 000d 7840 4e1c 0000 0000 0007
1307600 5758 5f8c 228c 7814 2cac 7818 0002 438a 2ca0 7820 0000 0000 0000 0001 000d 7800 000d 7840 000d 784a 000d 783c 000d 780c
1307660 2954 001c 0002 438a 56f8 5fa0 671c 5758 5fa0 6750 239c 0000 000d 4868 0000 4787 b328 0db7 000d 241c 0000 0000 27f0 0016
1307740 000d 78ac 4e1c 0000 0000 0007 54a8 54f8 228c 26ef 2cac 024b 0002 438a 2ca0 3a87 0000 0000 0000 0001 000d 786c 000d 78c0
1310020 000d 79e4 000d 79a8 000d 7878 28c4 0014 000d 78c0 56f8 76b0 239c 0000 000d 4898 2954 0018 0002 438a 56f8 6420 5758 6c34
1310100 6750 22bc 000d 4898 2b24 9743 0002 438a 000d 78ca 29c8 24af 000d 78d8 000d 78b6 000c 696e 7465 7273 6563 7469 6f6e 0000
1310160 27f0 000c 000d 790c 48f8 228c 2954 0010 0002 438a 239c 0000 000d 48f9 000a 7365 7470 726f 6475 6374 0000 0000 27f0 0014
1310240 000d 7968 56f8 5fa0 671c 22bc 000d 48c8 2cac 2167 0002 438a 2ca0 3a57 0000 0000 0000 0000 000d 792c 000d 7968 000d 798c
1310320 000d 7964 0000 0000 2954 0018 0002 438a 56f8 62c0 5758 6bf4 6750 22bc 000d 48f8 2b24 024b 0002 438a 000d 7972 29c8 024b
1310400 000d 7980 000d 7936 000b 6c69 7374 5f74 6f5f 7365 7400 0000 2c78 0018 0002 438a 3640 41e8 0000 0003 239c 0000 000d 79d0
1310460 000d 4918 0300 4867 0000 473f 0000 000c 000d 7a00 000d 7a00 0001 0053 0000 0000 0008 7375 6274 7261 6374 0000 27f0 0014
1310540 000d 7a28 4e1c 0000 0000 0007 4960 228c 2cac 7a09 0002 438a 2ca0 15af 0000 0000 0000 0001 000d 79ec 000d 7a28 000d 7a32
1310620 000d 7a24 000d 79f8 2954 001c 0002 438a 56f8 6420 bfcc a874 a8ac 9d88 ac4c 22bc 000d 79d0 000d 4948 0300 486f 0000 473f
1310700 0000 000c 000d 7abc 000d 7abc 0001 0053 0000 0000 000b 7472 616e 7370 6f73 655f 3100 7a79 0008 7061 6972 6672 6f6d 0000
1310760 27f0 001c 000d 7ae0 4e1c 0000 0000 0007 3574 35ec 239c 0000 000d 7aac 0008 cd2c 0200 48b7 0000 473f 0000 0008 000d 7b4c
1311040 000d 7b4c 0001 0053 0000 0000 2cac 7ac2 0002 438a 2ca0 7aca 0000 0000 0000 0001 000d 7a80 000d 7ae0 000d 7aea 000c 8868
1311120 2954 0028 0002 438a 56f8 67b8 682c 46ec 3588 33d8 3600 247c 000d 7b18 0018 3d6c 2410 0000 000d 7a54 000d 7a9c 0300 48b7
1311200 0000 473f 0000 000c 000d 7bb4 000d 7bb4 0001 0053 0000 0000 000b 6164 645f 656c 656d 656e 7400 0000 27f0 0014 000d 7b74
1311260 4e1c 0000 0000 0007 54a8 228c 2cac 7b52 0002 438a 2ca0 7b5a 0000 0000 0000 0001 000d 7b38 000d 7b74 000d 7b7e 000d 7b70
1311340 000d 7b44 2954 001c 0002 438a 56f8 5fa0 671c 5758 5370 6750 239c 0000 000d 7aac 0006 6973 5f73 6574 0000 0000 27f0 0016
1311420 000d 7bdc 4e1c 0000 0000 0007 54a8 54f8 228c 0393 2cac 7bba 0002 438a 2ca0 7bc2 0000 0000 0000 0001 000d 7b9c 000d 7bdc
1311500 000d 7be6 000d 7bd8 000d 7ba8 2954 0028 0002 438a 56f8 6420 5818 6670 0018 5758 6c84 0018 6750 57b8 6c34 6784 239c 0000
1311560 000d 7b18 b464 2390 000c 6b58 000d 82e4 2c78 0012 0002 438a 4e1c 0000 0000 4947 228c 0000 b464 8288 000e 22b4 0000 0000
1311640 2954 0012 0002 438a 4e1c 0000 0000 0007 228c 7c10 000d 7c3c 000d 4438 0200 1d17 0000 3287 0000 0008 000d 7c68 000d 7c68
1311720 0041 0000 0000 0000 2c78 0010 0002 438a 239c 0000 000d 4428 000d 7c48 0500 1d17 0000 3287 0000 0014 000d 7c98 000d 7c98
1312000 0041 0000 0000 0000 2c78 0010 0002 438a 239c 0000 000d 4448 000d 4458 0400 47af 0000 3287 0000 0010 000d 7cc8 000d 7cc8
1312060 0041 0000 0000 0000 2c78 0010 0002 438a 239c 0000 000d 4468 000d 4498 0300 47b7 0000 3287 0000 000c 000d 7cf8 000d 7cf8
1312140 0041 0000 0000 0000 2c78 0010 0002 438a 239c 0000 000d 4488 000d 7cd8 0400 47b7 0000 3287 0000 0010 000d 7d28 000d 7d28
1312220 0041 0000 0000 0000 2c78 0010 0002 438a 239c 0000 000d 44a8 000d 44b8 0100 47bf 0000 3287 0000 0004 000d 7d58 000d 7d58
1312300 0041 0000 0000 0000 2c78 0010 0002 438a 239c 0000 000d 44c8 000d 44d8 0300 47c7 0000 3287 0000 000c 000d 7d88 000d 7d88
1312360 0041 0000 0000 0000 2c78 0010 0002 438a 239c 0000 000d 44e8 000d 44f8 0200 47cf 0000 3287 0000 0008 000d 7db8 000d 7db8
1312440 0041 0000 0000 0000 2c78 0010 0002 438a 239c 0000 000d 4508 000d 4518 0300 47d7 0000 3287 0000 000c 000d 7de8 000d 7de8
1312520 0041 0000 0000 0000 2c78 0010 0002 438a 239c 0000 000d 4528 000d 4538 0300 47df 0000 3287 0000 000c 000d 7e18 000d 7e18
1312600 0041 0000 0000 0000 2c78 0010 0002 438a 239c 0000 000d 4548 000d 4588 0300 47e7 0000 3287 0000 000c 000d 7e48 000d 7e48
1312660 0041 0000 0000 0000 2c78 0010 0002 438a 239c 0000 000d 4568 000d 7e28 0400 47e7 0000 3287 0000 0010 000d 7e78 000d 7e78
1312740 0041 0000 0000 0000 2c78 0010 0002 438a 239c 0000 000d 4598 000d 45d8 0300 47ef 0000 3287 0000 000c 000d 7ea8 000d 7ea8
1313020 0041 0000 0000 0000 2c78 0010 0002 438a 239c 0000 000d 45b8 000d 7e88 0400 47ef 0000 3287 0000 0010 000d 7ed8 000d 7ed8
1313100 0041 0000 0000 0000 2c78 0010 0002 438a 239c 0000 000d 45e8 000d 45f8 0200 47f7 0000 3287 0000 0008 000d 7f08 000d 7f08
1313160 0041 0000 0000 0000 2c78 0010 0002 438a 239c 0000 000d 4608 000d 4628 0200 2b37 0000 3287 0000 0008 000d 7f38 000d 7f38
1313240 0041 0000 0000 0000 2c78 0010 0002 438a 239c 0000 000d 4638 000d 4658 0400 47ff 0000 3287 0000 0010 000d 7f68 000d 7f68
1313320 0041 0000 0000 0000 2c78 0010 0002 438a 239c 0000 000d 4668 000d 7248 0200 4807 0000 3287 0000 0008 000d 7f98 000d 7f98
1313400 0041 0000 0000 0000 2c78 0010 0002 438a 239c 0000 000d 4698 000d 730c 0200 480f 0000 3287 0000 0008 000d 7fc8 000d 7fc8
1313460 0041 0000 0000 0000 2c78 0010 0002 438a 239c 0000 000d 46c8 000d 46e8 0200 4817 0000 3287 0000 0008 000d 7ff8 000d 7ff8
1313540 0041 0000 0000 0000 2c78 0010 0002 438a 239c 0000 000d 46f8 000d 7530 0200 481f 0000 3287 0000 0008 000d 8028 000d 8028
1313620 0041 0000 0000 0000 2c78 0010 0002 438a 239c 0000 000d 4738 000d 747c 0200 4827 0000 3287 0000 0008 000d 8058 000d 8058
1313700 0041 0000 0000 0000 2c78 0010 0002 438a 239c 0000 000d 4768 000d 47c8 0200 482f 0000 3287 0000 0008 000d 8088 000d 8088
1313760 0041 0000 0000 0000 2c78 0010 0002 438a 239c 0000 000d 47a8 000d 8068 0300 482f 0000 3287 0000 000c 000d 80b8 000d 80b8
1314040 0041 0000 0000 0000 2c78 0010 0002 438a 239c 0000 000d 47d8 000d 47e8 0400 4837 0000 3287 0000 0010 000d 80e8 000d 80e8
1314120 0041 0000 0000 0000 2c78 0010 0002 438a 239c 0000 000d 47f8 000d 4818 0400 483f 0000 3287 0000 0010 000d 8118 000d 8118
1314200 0041 0000 0000 0000 2c78 0010 0002 438a 239c 0000 000d 4828 000d 4858 0200 4847 0000 3287 0000 0008 000d 8148 000d 8148
1314260 0041 0000 0000 0000 2c78 0010 0002 438a 239c 0000 000d 4868 000d 4888 0300 484f 0000 3287 0000 000c 000d 8178 000d 8178
```

```
1314340  0041 0000 0000 0000 2c78 0010 0002 438a 239c 0000 000d 4898 000d 48b8 0200 4857 0000 3287 0000 0008 000d 81a8 000d 81a8
1314420  0041 0000 0000 0000 2c78 0010 0002 438a 239c 0000 000d 48c8 000d 48e8 0200 485f 0000 3287 0000 0008 000d 81d8 000d 81d8
1314500  0041 0000 0000 0000 2c78 0010 0002 438a 239c 0000 000d 48f8 000d 79c0 0200 4867 0000 3287 0000 0008 000d 8208 000d 8208
1314560  0041 0000 0000 0000 2c78 0010 0002 438a 239c 0000 000d 4928 000d 7a44 0200 486f 0000 3287 0000 0008 000d 8238 000d 8238
1314640  0041 0000 0000 0000 2c78 0010 0002 438a 239c 0000 000d 4958 2c78 000a 0002 438a 228c 7c24 2b24 82dc 0002 438a 000e 47da
1314720  b464 1fd8 000d f934 0000 0000 b464 82b8 000e 531c 0000 0000 0006 6374 725f 6973 000d d7e0 b464 6c84 000e 231c 000d 6c80
1315000  b464 82a0 000e 23b8 000d 829c b464 1fb4 000e 23ec 0000 0000 0007 6374 725f 6f70 3200 829c b464 82d0 000e 53ec 0000 0000
1315060  b464 8270 000e 4d04 0000 0000 b464 830c 000e 5454 0000 0000 29c8 707c 000d 8254 000d e182 b464 842c 000d 2488 000e 1fd4
1315140  29c8 70e4 000d 82fc 000d d22e 2b24 82f4 0002 438a 000d d256 b464 2390 000e 54bc 0000 0000 29c8 830c 000d 8320 000d d1b2
1315220  2b24 8318 0002 438a 000d d1da 2954 000a 0002 438a 228c 0000 29c8 8330 000d 8344 000d cfd2 2b24 833c 0002 438a 000d 302a
1315300  29c8 726c 000d 835c 000d cf06 2b24 8354 0002 438a 000d cf2e 0007 6374 725f 6f70 3300 82a8 2b24 7330 0002 438a 000d ce2a
1315360  0007 666c 6174 7465 6e00 0000 29c8 8394 000d 749c 000d 2dfa 0007 6374 725f 696e 6300 d7d4 29c8 839c 000d 7550 000d cb5e
1315440  29c8 7554 000d 83bc 000d c9fe 2b24 83b4 0002 438a 000d ca46 2954 000c 0002 438a 4960 228c 0006 756e 696f 6e32 000d 83e0
1315520  b464 76ec 000d 2924 0000 0000 b464 83e4 000d 28f0 000d 83e0 b464 83f0 000d 2784 0000 0000 b464 83fc 000d 2750 0000 0000
1315600  b464 8408 000d 2690 0000 0000 b464 8414 000d 2618 0000 0000 29c8 7070 000e 1fa4 000d e11a 0007 7379 6d64 6966 6600 8440
1315660  0006 7375 6273 6574 000d 844c 0009 706f 7765 725f 7365 7400 0009 696e 7465 7273 6563 7400 0008 6469 736a 6f69 6e74 0070
1315740  0008 6c69 7374 732e 706c 007c 0000 002c 000a 2028 b27c b66c 0000 03fb 7fff ffff 000d 2418 0200 0db5 0200 2f35 0000 47a7
1316020  0000 02ab 0000 315f 0000 002c 0011 954c b27c b66c 0000 09bd 7fff ffff 0010 f3c4 0200 0db5 0200 224d 0000 5f2f 0000 3287
1316100  0000 315f 0010 7265 6d6f 7665 6462 5f63 7572 7265 6e74 0000 000d 852c 0000 002c b27c b66c 0000 09ac 0000 09bc 000a d16d
1316160  0200 0db5 0200 270d 0000 5f2f 0000 3287 0000 315f 27f0 0014 0010 f3e8 5d10 0000 0100 2627 5fa0 228c 000d 87f4 0000 002c
1316240  b27c b66c 0000 03fd 0000 044d 000a d16d 0200 0db5 0200 270d 0000 47a7 0000 2287 0000 315f 0000 002c 000d 24b0 b27c b66c
1316320  0000 03ff 7fff ffff 000d 8890 0200 0db5 0200 284d 0000 2287 0000 47a7 0000 315f 0000 0034 000d 2920 b27c b66c 0000 0400
1316400  7fff ffff 000d 88bc 0200 0db5 0400 242d 0000 2287 0000 0023 0000 2287 0000 21cf 0000 315f 0000 003c 000b 90d4 b27c b66c
1316460  0000 0401 7fff ffff 000d 8a28 0200 0db5 0200 2855 0400 2285 0000 0ab7 0000 0003 0000 0ab7 0000 0e3f 0000 2287 0000 315f
1316540  0000 0000 0000 0000 0000 0000 0000 0000 0000 0000 0000 0000 000b dfd4 000f ccb1 000f f7fd 000f f80d 000f f81d 000f c8dc
1316620  0000 0000 000a 2178 0000 0000 000a 20ad 0000 0000 0000 0000 000a 21e8 0000 0000 0000 0000 0000 0000 0000 0000 0000 0000
1316700  0000 0000 0000 0000 0018 7ebc 000a 2288 000a 22b8 0000 0000 0000 0000 0000 000a 22c8 0000 0000 0000 0000 0000 0000 0000
1316760  0000 0000 0000 0000 000a 22e8 0000 0000 0000 0000 0000 0000 0000 0000 000a 212d 0000 0000 000a 2065 000a e479 000a 2085
1317040  000a 23c8 000d cbed 0000 0000 0000 0000 0000 0000 0000 0000 0000 0000 0019 7251 0019 7258 0019 7268 0019 7278 0019 7288
1317120  0019 72b1 0000 0000 0000 0000 000a 213d 0000 0000 0000 0000 0000 0000 0000 000a 2168 0000 0000 0000 0000 0000 0000 0000
1317200  0000 0000 0000 0000 0000 0000 0000 0000 0000 0000 0000 0000 000a 20c5 0000 0000 000a e4c9 0000 0000 0000 0000 0000 0000
1317260  000a 20f5 000b dffd 0000 0000 000a 2278 0000 0000 0000 0000 0000 0000 000a 20d5 0000 0000 0000 0000 0000 0000 0000 0000
1317340  0000 0000 0000 0000 0000 0000 0000 0000 0000 0000 000b ad0d 000b ad45 0000 0000 000a 2055 000a 2318 0000 0000 0000 0000
1317420  0000 0000 0000 0000 0018 7e64 0000 0000 0000 0000 0018 7f4d 0000 0000 0018 7e9c 0018 7f05 0018 7e85 0018 7e8c 0018 7eac
1317500  0018 7ee5 0018 7f35 0018 7f7d 000a 2428 0000 0000 0000 0000 0000 0000 000a 2458 000d 8860 0000 002c b288 b66c 0000 0402
1317560  7fff ffff 000a 2028 0200 0db5 0100 15ad 0100 33fd 0000 000b 0000 315f 0000 002c 000a f3d0 b27c b66c 0000 042c 7fff ffff
1317640  000d 2444 0200 0db5 0200 224d 0000 49b7 0000 4987 0000 315f 2c78 0012 0002 438a 4e1c 0000 0000 4a37 228c 0000 000d 8a90
1317720  0000 002c b27c b66c 0000 0405 0000 042b 000a d163 0200 0db5 0200 270d 0000 49b7 0000 4987 0000 315f 0000 002c 000d 855c
1320000  b27c b66c 0000 0407 7fff ffff 000d d9e8 0200 0db5 0200 284d 0000 4987 0000 49b7 0000 315f 0000 0034 000d 8588 b27c b66c
1320060  0000 0408 7fff ffff 000d 88f0 0200 0db5 0400 242d 0000 498f 0000 0013 0000 4987 0000 21cf 0000 315f 0000 0034 000d 88bc
1320140  b27c b66c 0000 0409 7fff ffff 000d 8924 0200 0db5 0400 242d 0000 498f 0000 001b 0000 4987 0000 21cf 0000 315f 0000 0034
1320220  000d 88f0 b27c b66c 0000 040a 7fff ffff 000d 8958 0200 0db5 0400 242d 0000 4997 0000 000b 0000 4987 0000 21cf 0000 315f
1320300  0000 0034 000d 8924 b27c b66c 0000 040b 7fff ffff 000d 898c 0200 0db5 0400 242d 0000 4997 0000 0013 0000 4987 0000 21cf
1320360  0000 315f 0000 0034 000d 8958 b27c b66c 0000 040c 7fff ffff 000d 89c0 0200 0db5 0400 242d 0000 4997 0000 001b 0000 4987
1320440  0000 21cf 0000 315f 0000 0034 000d 898c b27c b66c 0000 040d 7fff ffff 000d 89f4 0200 0db5 0400 242d 0000 49bf 0000 0013
1320520  0000 4987 0000 21cf 0000 315f 0000 0034 000d 89c0 b27c b66c 0000 040e 7fff ffff 000d da14 0200 0db5 0400 242d 0000 49c7
1320600  0000 001b 0000 4987 0000 21cf 0000 315f 0000 0034 000d 85bc b27c b66c 0000 040f 7fff ffff 000d 8a5c 0200 0db5 0200 2855
1320660  0200 498d 0000 0ab7 0000 0003 0000 4987 0000 315f 0000 0038 000d 8a28 b27c b66c 0000 0410 7fff ffff 000d a8f0 0200 0db5
1320740  0200 2855 0300 498d 0000 0ab7 0000 0ab7 0000 0003 0000 4987 0000 315f 000d 8bcc 0000 00d4 b27c b66c 0000 0411 0000 042d
1321020  000d 8af8 0200 0db5 0500 1cdd 0000 49cf 0000 0013 0000 4987 0070 cb03 0000 02b3 0000 315f 000d 8af4 0000 002c b4f0 b4e4
1321100  0000 0410 7fff ffff 0008 b0dd 0000 0000 0000 0000 000d 9568 0002 438a 000e 1ad0 000d 8b2c 0000 0038 b27c b66c 0000 0413
1321160  0000 042e 000d 8b30 0200 0db5 0500 1cdd 0000 2def 0000 000b 0000 4987 0070 ce43 0000 02b3 0000 315f 000d 8bcc 0000 0038
1321240  b27c b66c 0000 0414 0000 042f 000d 8bd0 0200 0db5 0500 1cdd 0000 498f 0000 0013 0000 4987 0070 c403 0000 02b3 0000 315f
1321320  27f0 0068 000d 832c 45b8 46ec 44a0 0000 0200 49cf 5fa0 5370 447c 0000 0200 0daf 4b8c 0000 0000 4987 6bb4 247c 0008 b2fc
1321400  0014 39f8 0008 b67c 0010 43c0 0100 49df 6d0c 43e4 0200 49cf 5fa0 6b74 447c 0000 0200 0daf 4b8c 0000 0000 4987 6bb4 247c
```

```
1321460 0008 b2fc 000c c5a8 000d 8c78 0000 0070 b27c b66c 0000 0415 0000 0430 000d 8c08 0200 0db5 0500 1cdd 0000 4997 0000 000b
1321540 0000 4987 0070 c603 0000 02b3 0000 315f 000d 8c78 0000 0038 b27c b66c 0000 0416 0000 0431 000d 8c7c 0200 0db5 0500 1cdd
1321620 0000 4997 0000 0013 0000 4987 0070 c703 0000 02b3 0000 315f 2c78 003c 0002 438a 45c4 4700 44a0 0000 0200 49cf 5fa0 69b0
1321700 447c 0000 0200 0daf 4b8c 0000 0000 4987 6bb4 247c 0008 db5c 0018 2ecc 23fc 0000 000e 1a68 000d 8d54 0000 0070 b27c b66c
1321760 0000 0417 0000 0432 000d 8cb4 0200 0db5 0500 1cdd 0000 49e7 0000 001b 0000 4987 0070 d343 0000 02b3 0000 315f 000d 8d54
1322040 0000 0038 b27c b66c 0000 0418 0000 0433 000d 8d58 0200 0db5 0500 1cdd 0000 498f 0000 001b 0000 4987 0070 c503 0000 02b3
1322120 0000 315f 27f0 006c 000d 7268 45c4 46d8 4768 43e4 0200 49cf 5fa0 5370 447c 0000 0200 0daf 4b8c 0000 0000 4987 6bb4 247c
1322200 0008 b2fc 0018 3a4c 0008 b67c 0014 43c0 0200 0ad7 6d50 6d0c 44a0 0000 0200 49cf 5fa0 6b74 447c 0000 0200 0daf 4b8c 0000
1322260 0000 4987 6bb4 247c 0008 b2fc 000c c5a8 000d 8de4 0000 0038 b27c b66c 0000 0419 0000 0434 000d 8de8 0200 0db5 0500 1cdd
1322340 0000 49c7 0000 001b 0000 4987 0070 ca03 0000 02b3 0000 315f 2c78 0056 0002 438a 45c4 46d8 4768 37dc 3ba0 0000 0008 c83c
1322420 0018 aa18 aab4 0003 a554 000a 23fc 0000 000e 1b3c aa18 aab4 00fa a554 000c 4390 23fc 0000 000e 1b5c aa18 ab40 0000 f424
1322500 a554 000a 23fc 0000 000e 1b7c c5a8 6c65 000d 8e48 0000 0038 b27c b66c 0000 041a 0000 0435 000d 8e4c 0200 0db5 0500 1cdd
1322560 0000 49ef 0000 001b 0000 4987 0070 d3e3 0000 02b3 0000 315f 2954 002c 0002 438a 4e1c 0000 0000 001b 5758 67b8 55f0 6750
1322640 55f0 671c 5370 5bc4 0300 000f 6c34 6bb4 6b74 228c 000d 8eb0 0000 0038 b27c b66c 0000 041b 0000 0436 000d 8eb4 0200 0db5
1322720 0500 1cdd 0000 49f7 0000 0023 0000 4987 0070 dae3 0000 02b3 0000 315f 2c78 0030 0002 438a 45b8 46ec 4768 47e4 3844 41e8
1323000 0000 000f 379c 6f34 3968 0018 38d4 41fc 0000 000b 2410 0000 000e 1c3c 000d 8f50 0000 0038 b27c b66c 0000 041c 0000 0437
1323060 000d 8f54 0200 01b5 0500 1cdd 0000 49f7 0000 002b 0000 4987 0070 e1e3 0000 02b3 0000 315f 2c78 0066 0002 438a 45e8 0020
1323140 5758 6af0 001c 6a00 4768 47e4 4910 0018 aa88 0020 aab4 0001 a4bc 002e 3894 001c 3818 379c 6e74 aa88 0020 aaf0 ffff ac08
1323220 aa50 aaf0 0001 ac90 3914 0018 38e8 37f0 242c 0000 000e 1c3c 3894 001c 3818 379c 6e74 3788 4a7c 000c 723c 5365 000d 9000
1323300 0000 0078 b27c b66c 0000 041d 0000 0438 000d 9004 0200 0db5 0500 1cdd 0000 49ff 0000 001b 0000 4987 0070 dbe3 0000 02b3
1323360 0000 315f 000d 9000 0000 0040 000e 1df5 000e 1dcc 000e 1eac 0000 0000 0000 0000 000e 1ebc 0000 0000 0000 0000 0000 0000
1323440 0000 0000 0000 0000 0000 0000 0000 0000 000e 1c4c 2c78 0038 0002 438a 45b8 46ec 4768 aa18 aaf0 00f9 aab4 00fa 9eb8 ac90
1323520 4254 0000 0000 0a87 379c 6f34 38d4 41fc 0000 000b 2410 0000 000e 1a88 000d 90ac 0000 0038 b27c b66c 0000 041e 0000 0439
1323600 000d 90b0 0200 0db5 0500 1cdd 0000 49ff 0000 0023 0000 4987 0070 d443 0000 02b3 0000 315f 2c78 0074 0002 438a 45dc 4728
1323660 001c 4740 47bc aa6c aab4 00fa a4bc 003e 34a0 0020 33d8 382c 001c 42ac 0000 07d3 000e 1b5c 0024 386c 37f0 3774 6e74 aa6c
1323740 aaf0 ff06 ac08 aa18 aaf0 0001 ac90 38c0 3e70 0020 242c 0000 000e 1a88 4390 33d8 382c 001c 3c48 0000 000e 1b5c 0018 3d6c
1324020 37f0 3774 6e74 723c 000d 9130 0000 0038 b27c b66c 0000 041f 0000 043a 000d 9134 0200 0db5 0500 1cdd 0000 4997 0000 001b
1324100 0000 4987 0070 c803 0000 02b3 0000 315f 2c78 004c 0002 438a 45b8 4700 4754 43c0 0100 33ff 6d50 247c 000e 1cb4 0018 aa50
1324160 aab4 00fa a554 000e 38c0 437c 3804 2340 000e 1cd4 aa50 aaf0 00f9 aab4 00fa 9eb8 ac4c 38c0 437c 2340 000e 1cf4 000d 91e4
1324240 0000 0070 b27c b66c 0000 0420 0000 043b 000d 916c 0200 0db5 0500 1cdd 0000 4a07 0000 000b 0000 4987 0070 e5a3 0000 02b3
1324320 0000 315f 000d 91e4 0000 0038 b27c b66c 0000 0421 0000 043c 000d 91e8 0200 0db5 0500 1cdd 0000 4a0f 0000 0023 0000 4987
1324400 0070 e6a3 0000 02b3 0000 315f 2c78 0044 0002 438a 45c4 4700 477c 47f8 001c 43e4 0200 49cf 5fa0 69b0 447c 0000 0200 0daf
1324460 4b8c 0000 0000 4987 6bb4 247c 0008 db5c 0020 2ecc 3984 0018 001c 2304 000e 1d34 000d 9270 0000 0038 b27c b66c 0000 0422
1324540 0000 043d 000d 9274 0200 0db5 0500 1cdd 0000 4a0f 0000 002b 0000 4987 0070 e9a3 0000 02b3 0000 315f 2954 0054 0002 438a
1324620 5d10 0000 0200 0ad7 687c 001c 6aa0 46d8 4754 47d0 4880 0018 0020 38fc 001c 3894 0020 37dc 3ba0 0000 000e 1dac 0024 38fc
1324700 0020 43c0 0200 0ad7 6e58 001c 6e08 4568 6b74 6d94 2410 0000 000e 1cd4 000d 930c 0000 0038 b27c b66c 0000 0423 0000 043e
1324760 000d 9310 0200 0db5 0500 1cdd 0000 4a1f 0000 0023 0000 4987 0070 ed63 0000 02b3 0000 315f 2c78 0064 0002 438a 45e8 001c
1325040 46ec 4768 47e4 aa88 001c aab4 0000 a1d0 0004 22a0 aa88 001c aaf0 ffff ad64 3410 0020 3818 37c4 001c 6e74 9350 0020 93a8
1325120 0022 3804 37c4 0020 ad94 aab4 0000 a4bc 0012 3eec 0020 37f0 37c4 001c 6e74 2c88 0002 2304 000e 1dac 000d 9388 0000 0038
1325200 b27c b66c 0000 0424 0000 043f 000d 938c 0200 01b5 0500 1cdd 0000 4a17 0000 0023 0000 4987 0070 e7a3 0000 02b3 0000 315f
1325260 2c78 0044 0002 438a 45c4 4700 477c 47f8 001c 43e4 0200 49cf 5fa0 69b0 447c 0000 0200 0daf 4b8c 0000 0000 4987 6bb4 247c
1325340 0008 db5c 0020 2ecc 3904 0018 001c 2304 000e 1e0c 000d 9414 0000 0038 b27c b66c 0000 0425 0000 0440 000d 9418 0200 0db5
1325420 0500 1cdd 0000 4a17 0000 002b 0000 4987 0070 f063 0000 02b3 0000 315f 2954 0054 0002 438a 5d10 0000 0200 0ad7 687c 001c
1325500 6aa0 46d8 4754 47d0 4880 0018 0020 38fc 001c 3894 0020 37dc 3ba0 0000 000e 1e84 0024 38fc 0020 43c0 0200 0ad7 6e58 001c
1325560 6e08 4568 6b74 6d94 2410 0000 000e 1cf4 000d 94b8 0000 0038 b27c b66c 0000 0426 0000 0441 000d 94bc 0200 0db5 0500 1cdd
1325640 0000 4a27 0000 0023 0000 4987 0070 f423 0000 02b3 0000 315f 2c78 006c 0002 438a 45dc 46d8 4754 47d0 3410 0020 37dc 37b0
1325720 6e74 3410 0024 3804 37b0 6e74 3410 001c 4254 0000 0000 000f 37c4 0024 6f34 3f68 0024 3858 3e70 0020 40b4 001c 000e 1dac
1326000 001c aa6c aab4 0001 a1d0 0004 22a0 aa6c aaf0 ffff ac08 38d4 3858 37dc 242c 0000 000e 1e84 000d 9564 0000 0070 b27c b66c
1326060 0000 0427 0000 0442 000d 94f4 0200 0db5 0500 1cdd 0000 49bf 0000 0013 0000 4987 0070 c903 0000 02b3 0000 315f 000d 9564
1326140 0000 0038 b27c b66c 0000 0428 0000 0443 000d 9568 0200 0db5 0500 1cdd 0000 49bf 0000 001b 0000 4987 0070 f7a3 0000 02b3
1326220 0000 315f 2c78 003c 0002 438a 45c4 4700 477c 43e4 0200 49cf 5fa0 69b0 447c 0000 0200 0daf 4b8c 0000 0000 4987 6bb4 247c
1326300 0008 db5c 001c 2ecc 23e4 0000 000e 1f14 000d 95d0 0000 0038 b130 b66c 0000 0429 0000 0444 000d 8acd 0200 0db5 0500 1cdd
1326360 0000 49bf 0000 0023 0000 4987 0070 f8a3 0000 02b3 0000 315f 2954 0034 0002 438a 5d10 0000 0200 0ad7 6110 001c 48f8 3724
1326440 0018 3664 44a0 0000 0200 0abf 6c84 001c 6c48 0018 239c 0000 000e 1ef4 000d aaf0 0000 0eb8 7320 616e 206f 7264 7365 742c
1326520 2064 6573 7069 7465 2053 6574 322e 0a0a 696e 7465 7273 6563 7469 6f6e 285b 5d2c 205f 2c20 5b5d 292e 0a69 6e74 6572 7365
```

```
1326600 6374 696f 6e28 5b45 6c65 6d65 6e74 7c45 6c65 6d65 6e74 735d 2c20 5365 742c 2049 6e74 6572 7365 6374 696f 6e29 203a 2d0a
1326660 096d 656d 6265 7263 686b 2845 6c65 6d65 6e74 2c20 5365 7429 2c0a 0921 2c0a 0949 6e74 6572 7365 6374 696f 6e20 3d20 5b45
1326740 6c65 6d65 6e74 7c52 6573 745d 2c0a 0969 6e74 6572 7365 6374 696f 6e28 456c 656d 656e 7473 2c20 5365 742c 2052 6573 7429
1327020 2e0a 696e 7465 7273 6563 7469 6f6e 285b 5f7c 456c 656d 656e 7473 5d2c 2053 6574 2c20 496e 7465 7273 6563 7469 6f6e 2920
1327100 3a2d 0a09 696e 7465 7273 6563 7469 6f6e 2845 6c65 6d65 6e74 732c 2053 6574 2c20 496e 7465 7273 6563 7469 6f6e 292e 0a0a
1327160 0a0a 2520 2020 696e 7465 7273 6563 7469 6f6e 282b 4c69 7374 4f66 5365 7473 2c20 3f49 6e74 6572 7365 6374 696f 6e29 0a25
1327240 2020 2069 7320 7472 7565 2077 6865 6e20 496e 7465 7273 6563 7469 6f6e 2069 7320 7468 6520 696e 7465 7273 6563 7469 6f6e
1327320 206f 6620 616c 6c20 7468 6520 7365 7473 2069 6e0a 2520 2020 4c69 7374 4f66 5365 7473 2e20 2054 6865 206f 7264 6572 206f
1327400 6620 656c 656d 656e 7473 2069 6e20 496e 7465 7273 6563 7469 6f6e 2069 7320 7461 6b65 6e20 6672 6f6d 0a25 2020 2074 6865
1327460 2066 6972 7374 2073 6574 2069 6e20 4c69 7374 4f66 5365 7473 2e20 2054 6869 7320 6861 7320 6265 656e 2074 7572 6e65 6420
1327540 696e 7369 6465 206f 7574 2074 6f0a 2520 2020 6169 6e69 6d69 7365 2074 6865 2073 746f 7261 6765 2074 7572 6e6f 7665 722e
1327620 0a0a 696e 7465 7273 6563 7469 6f6e 285b 5365 747c 5365 7473 5d2c 2049 6e74 6572 7365 6374 696f 6e29 203a 2d0a 0969 6e74
1327700 6572 7365 6374 696f 6e31 2853 6574 2c20 5365 7473 2c20 496e 7465 7273 6563 7469 6f6e 292e 0a0a 696e 7465 7273 6563 7469
1327760 6f6e 3128 5b5d 2c20 5f2c 205b 5129 2e0a 696e 7465 7273 6563 7469 6f6e 3128 5b45 6c65 6d65 6e74 7c45 6c65 6d65 6e74 735d
1330040 2c20 5365 7473 2c20 496e 7465 7273 6563 7469 6f6e 2920 3a2d 0a09 6d65 6d62 6572 6368 6b5f 616c 6c28 5365 7473 2c20 456c
1330120 656d 656e 7429 2c0a 0921 2c0a 0949 6e74 6572 7365 6374 696f 6e20 3d20 5b45 6c65 6d65 6e74 7c52 6573 745d 2c0a 0969 6e74
1330200 6572 7365 6374 696f 6e31 2845 6c65 6d65 6e74 732c 2053 6574 732c 2052 6573 7429 2e0a 696e 7465 7273 6563 7469 6f6e 3128
1330260 5b5f 7c45 6c65 6d65 6e74 735d 2c20 5365 7473 2c20 496e 7465 7273 6563 7469 6f6e 2920 3a2d 0a09 696e 7465 7273 6563 7469
1330340 6f6e 3128 456c 656d 656e 7473 2c20 5365 7473 2c20 496e 7465 7273 6563 7469 6f6e 292e 0a0a 6d65 6d62 6572 6368 6b5f 616c
1330420 6c28 5b5d 2c20 5f29 2e0a 6d65 6d62 6572 6368 6b5f 616c 6c28 5b53 6574 7c53 6574 735d 2c20 456c 656d 656e 7429 203a 2d0a
1330500 096d 656d 6265 7263 686b 2845 6c65 6d65 6e74 2c20 5365 7429 2c0a 096d 656d 6265 7263 686b 5f61 6c6c 2853 6574 732c 2045
1330560 6c65 6d65 6e74 292e 0a0a 0a25 2020 2069 6e74 6572 7365 6374 282b 5365 7431 2c20 2b53 6574 322c 203f 496e 7465 7273 6563
1330640 7469 6f6e 290a 2520 2020 6973 2061 6e20 6f62 736f 6c65 7465 2073 796e 6f6e 796d 206f 6620 696e 7465 7273 6563 7469 6f6e
1330720 2f33 2c0a 0a69 6e74 6572 7365 6374 2853 6574 312c 2053 6574 322c 2049 6e74 6572 7365 6374 696f 6e29 203a 2d0a 0969 6e74
1331000 6572 7365 6374 696f 6e28 5365 7431 2c20 5365 7432 2c20 496e 7465 7273 6563 7469 6f6e 292e 0a0a 0a0a 2520 2020 7375 6274
1331060 7261 6374 282b 5365 7431 2c20 2b53 6574 322c 203f 4469 6666 6572 656e 6365 290a 2520 2020 6973 206c 696b 6520 696e 7465
1331140 7273 6563 742c 2062 7574 2074 6869 7320 7469 6d65 2069 7420 6973 2074 6865 2065 6c65 6d65 6e74 7320 6f66 2053 6574 3120
1331220 7768 6963 680a 2520 2020 2a61 7265 2a20 696e 2053 6574 3220 7468 6174 2061 7265 2064 656c 6574 6564 2e20 204e 6f74 6520
1331300 7468 6174 2064 7570 6c69 6361 7465 6420 456c 656d 656e 7473 206f 660a 2520 2020 5365 7431 2077 6869 6368 2061 7265 206e
1331360 6f74 2069 6e20 5365 7432 2061 7265 2072 6574 6169 6e65 6420 696e 2044 6966 6665 7265 6e63 652e 0a0a 7375 6274 7261 6374
1331440 285b 512c 205f 2c20 5b5d 292e 0a73 7562 7472 6163 7428 5b45 6c65 6d65 6e74 7c45 6c65 6d65 6e74 735d 2c20 5365 742c 2044
1331520 6966 6665 7265 6e63 6529 203a 2d0a 096d 656d 6265 7263 686b 2845 6c65 6d65 6e74 2c20 5365 7429 2c0a 0921 2c0a 0973 7562
1331600 7472 6163 7428 456c 656d 656e 7473 2c20 5365 742c 2044 6966 6665 7265 6e63 6529 2e0a 7375 6274 7261 6374 285b 456c 656d
1331660 656e 747c 456c 656d 656e 7473 5d2c 2053 6574 2c20 5b45 6c65 6d65 6e74 7c44 6966 6665 7265 6e63 655d 2920 3a2d 0a09 7375
1331740 6274 7261 6374 2845 6c65 6d65 6e74 732c 2053 6574 2c20 4469 6666 6572 656e 6365 292e 0a0a 0a0a 2520 2020 7379 6d64 6966
1332020 6628 2b53 6574 312c 202b 5365 7432 2c20 3f44 6966 6665 7265 6e63 6529 0a25 2020 2069 7320 7472 7565 2077 6865 6e20 4469
1332100 6666 6572 656e 6365 2069 7320 7468 6520 7379 6d6d 6574 7269 6320 6469 6666 6572 656e 6365 206f 6620 5365 7431 2061 6e64
1332160 2053 6574 322c 0a25 2020 2074 6861 7420 6973 2c20 6966 2065 6163 6820 656c 656d 656e 7420 6f66 2055 6e69 6f6e 206f 6363
1332240 7572 7320 696e 206f 6e65 206f 6620 5365 7431 2061 6e64 2053 6574 3220 6275 740a 2520 2020 6e6f 7420 626f 7468 2e20 2054
1332320 6865 2063 6f6e 7374 7275 6374 696f 6e20 6d65 7468 6f64 2069 7320 7375 6368 2074 6861 7420 7468 6520 616e 7377 6572 2077
1332400 696c 6c20 6861 7665 0a25 2020 206e 6f20 6475 706c 6963 6174 6573 2065 7665 6e20 6966 2074 6865 2053 6574 7320 646f 2e0a
1332460 0a73 796d 6469 6666 2853 6574 312c 2053 6574 322c 2044 6966 6665 7265 6e63 6529 203a 2d0a 0973 796d 6469 6666 2853 6574
1332540 312c 2053 6574 322c 2044 6966 6665 7265 6e63 652c 2044 6966 6665 7265 6e63 6531 292c 0a09 7379 6d64 6966 6628 5365 7432
1332620 2c20 5365 7431 2c20 4469 6666 6572 656e 6365 312c 205b 5d29 2e0a 0a73 796d 6469 6666 285b 5d2c 205f 2c20 4469 6666 2c20
1332700 4469 6666 292e 0a73 796d 6469 6666 285b 456c 656d 7c52 6573 745d 2c20 4176 6f69 642c 2044 6966 6630 2c20 4469 6666 2920
1332760 3a2d 0a09 6d65 6d62 6572 6368 6b28 456c 656d 2c20 4176 6f69 6429 2c0a 0921 2c0a 0973 796d 6469 6666 2852 6573 742c 2041
1333040 766f 6964 2c20 4469 6666 302c 2044 6966 6629 2e0a 7379 6d64 6966 6628 5b45 6c65 6d7c 5265 7374 5d2c 2041 766f 6964 2c20
1333120 5b45 6c65 6d7c 4469 6666 315d 2c20 4469 6666 2920 3a2d 0a09 7379 6d64 6966 6628 5265 7374 2c20 5b45 6c65 6d7c 4176 6f69
1333200 645d 2c20 4469 6666 312c 2044 6966 6629 2e0a 0a0a 0a25 2020 2073 6574 7072 6f64 7563 7428 5365 7431 2c20 5365 7432 2c20
1333260 4361 7274 6573 6961 6e50 726f 6475 6374 290a 2520 2020 6973 2074 7275 6520 7768 656e 2053 6574 3120 6973 2061 2073 6574
1333340 2028 6c69 7374 2920 616e 6420 5365 7432 2069 7320 6120 7365 7420 286c 6973 7429 2061 6e64 0a25 2020 2043 6172 7465 7369
1333420 616e 5072 6f64 7563 7420 6973 2061 2073 6574 206f 6620 456c 7431 2d45 6c74 3220 7061 6972 732c 2077 6974 6820 6120 7061
1333500 6972 2066 6f72 0a25 2020 2066 6f72 2065 6163 6920 656c 656d 656e 7420 456c 7431 206f 6620 5365 7431 2061 6e64 2045 6c74
1333560 3220 6f66 2053 6574 322e 0a0a 7365 7470 726f 6475 6374 285b 5d2c 205f 2c20 5b5d 292e 0a73 6574 7072 6f64 7563 7428 5b48
1333640 7c54 5d2c 204c 2c20 5072 6f64 7563 7429 203a 2d0a 0973 6574 7072 6f64 7563 7428 4c2c 2048 2c20 5072 6f64 7563 742c 2052
```

```
1333720 6573 7429 2c0a 0973 6574 7072 6f64 7563 7428 542c 204c 2c20 5265 7374 292e 0a0a 7365 7470 726f 6475 6374 285b 5d2c 205f
1334000 2c20 4c2c 204c 292e 0a73 6574 7072 6f64 7563 7428 5b48 7c54 5d2c 2058 2c20 5b58 2d48 7c54 585d 2c20 544c 2920 3a2d 0a09
1334060 7365 7470 726f 6475 6374 2854 2c20 582c 2054 582c 2054 4c29 2e0a 0a0a 0a25 2020 2064 6973 6a6f 696e 745f 756e 696f 6e28
1334140 2b53 6574 312c 202b 5365 7432 2c20 3f55 6e69 6f6e 290a 2520 2020 6973 2074 7275 6520 7768 656e 2064 6973 6a6f 696e 7428
1334220 5365 7431 2c20 5365 7432 2920 616e 6420 756e 696f 6e28 5365 7431 2c20 5365 7432 2c20 556e 696f 6e29 2c0a 2520 2020 7468
1334300 6174 2069 732c 2053 6574 3120 616e 6420 5365 7432 2068 6176 6520 6e6f 2065 6c65 6d65 6e74 2069 6e20 636f 6d6d 616e 6420
1334360 616e 6420 556e 696f 6e20 6973 0a25 2020 2074 6865 6972 2075 6e69 6f6e 2e0a 0a64 6973 6a6f 696e 745f 756e 696f 6e28 5b5d
1334440 2c20 556e 696f 6e2c 2055 6e69 6f6e 292e 0a64 6973 6a6f 696e 745f 756e 696f 6e28 5b45 6c65 6d65 6e74 7c45 6c65 6d65 6e74
1334520 735d 2c20 5365 742c 205b 456c 656d 656e 747c 556e 696f 6e5d 2920 3a2d 0a09 6e6f 6e6d 656d 6265 7228 456c 656d 656e 742c
1334600 2053 6574 292c 0a09 6469 736a 6f69 6e74 5f75 6e69 6f6e 2845 6c65 6d65 6e74 732c 2053 6574 2c20 556e 696f 6e29 2e0a 0a0a
1334660 0a25 2020 2075 6e69 6f6e 282b 5365 7431 2c20 2b53 6574 322c 203f 556e 696f 6e29 0a25 2020 2069 7320 7472 7565 2077 6865
1334740 6e20 7375 6274 7261 6374 2853 6574 312c 5365 7432 2c44 6966 6629 2061 6e64 2061 7070 656e 6428 4469 6666 2c53 6574 322c
1335020 556e 696f 6e29 2c0a 2520 2020 7468 6174 2069 732c 2077 6865 6e20 556e 696f 6e20 6973 2074 6865 2065 6c65 6d65 6e74 7320
1335100 6f66 2053 6574 3120 7468 6174 2064 6f20 6e6f 7420 6f63 6375 7220 696e 0a25 2020 2053 6574 322c 2066 6f6c 6c6f 7765 6420
1335160 6279 2061 6c6c 2074 6865 2065 6c65 6d65 6e74 7320 6f66 2053 6574 322e 0a0a 756e 696f 6e28 5b5d 2c20 556e 696f 6e2c 2055
1335240 6e69 6f6e 292e 0a75 6e69 6f6e 285b 456c 656d 656e 747c 456c 656d 656e 7473 5d2c 2053 6574 2c20 556e 696f 6e29 203a 2d0a
1335320 096d 656d 6265 7263 686b 2845 6c65 6d65 6e74 2c20 5365 7429 2c0a 0921 2c0a 0975 6e69 6f6e 2845 6c65 6d65 6e74 732c 2053
1335400 6574 2c20 556e 696f 6e29 2e0a 756e 696f 6e28 5b45 6c65 6d65 6e74 7c45 6c65 6d65 6e74 735d 2c20 5365 742c 205b 456c 656d
1335460 656e 747c 556e 696f 6e5d 2920 3a2d 0a09 756e 696f 6e28 456c 656d 656e 7473 2c20 5365 742c 2055 6e69 6f6e 292e 0a0a 0a0a
1335540 2520 2020 756e 696f 6e28 2b53 6574 312c 202b 5365 7432 2c20 3f55 6e69 6f6e 2c20 3f44 6966 6665 7265 6e63 6529 0a25 2020
1335620 2069 7320 7472 7565 2077 6865 6e2c 756e 696f 6e28 5365 7431 2c20 5365 7432 2c20 556e 696f 6e29 2061 6e64 2073 7562 7472
1335700 6163 7428 5365 7431 2c20 5365 7432 2c20 4469 6666 6572 656e 6365 292e 0a25 2020 2054 6869 7320 7761 7320 6164 6465 6420
1335760 746f 206b 000c 1bfc 0300 48c7 0000 4747 0000 000c 000d c86c 000d 6bb4 0001 0054 0000 0000 0008 cd8c 0300 48cf 0000 4747
1336040 0000 000c 000d c898 000d 83c8 0001 0054 0000 0000 0008 cdac 0100 48d7 0000 4747 0000 0008 000d c908 000d c908 0001 0054
1336120 0000 0000 0008 cdcc 0200 48df 0000 4747 0000 0008 000d 2a84 000d 7620 0001 0054 0000 0000 0008 cdec 0300 48e7 0000 4747
1336200 0000 000c 000d d10c 000d d10c 0001 0054 0000 0000 000d 7458 000a 35dc 0008 ce0c 0200 48ef 0000 4747 0000 0008 000d ca68
1336260 000d ca68 0001 0054 0000 0000 000d 7428 000a 35ec 000d a52c 0300 48ef 0000 4747 0000 000c 000d cea0 000d cea0 0001 0054
1336340 0000 0000 000c 163c 0200 48f7 0000 4747 0000 0008 000d cd7c 000d cd7c 0001 0054 0000 0000 000d 72e4 000a 35fc 000d a574
1336420 0300 48f7 0000 4747 0000 000c 000d cd08 000d cd08 0001 0054 0000 0000 000c 166c 0200 48ff 0000 4747 0000 0008 000d cb2c
1336500 000d cb2c 0001 0054 0000 0000 000d 72b4 000a 360c 000c 169c 0400 4907 0000 4747 0000 0010 000d ca14 000d ca14 0001 0054
1336560 0000 0000 000d 7228 000a 361c 000c 16cc 0200 490f 0000 4747 0000 0008 000d cba0 000d cba0 0001 0054 0000 0000 000d 71cc
1336640 000a 362c 000d 80c8 0300 4837 0000 4747 0000 000c 000d c92c 000d 2b20 0001 0054 0000 0000 000d 80f8 0300 483f 0000 4747
1336720 0000 000c 000d c990 000d 2b88 0001 0054 0000 0000 000c 175c 0200 4917 0000 4747 0000 0008 000d caec 000d caec 0001 0054
1337000 0000 0000 000d 7138 000a 363c 000c 173c 0300 491f 0000 4747 0000 000c 000d d014 000d d014 0001 0054 0000 0000 000d 70ec
1337060 000a d6e0 000c 17bc 0200 4927 0000 4747 0000 0008 000d cab4 000d cab4 0001 0054 0000 0000 000d 7030 000a d754 000c 17ec
1337140 0300 492f 0000 4747 0000 000c 000d ced4 000d ced4 0001 0054 0000 0000 0011 b6b4 000b 1e74 0011 b78c 0000 0000 000c 184c
1337220 0300 4937 0000 4747 0000 000c 000d cf48 000d cf48 0001 0054 0000 0000 0011 bb54 000a 330c 0011 bd70 000f bc64 000c 187c
1337300 0200 493f 0000 4747 0000 0008 000d 319c 000d 319c 0001 0054 0000 0000 0011 bd50 000a 3008 0011 fab4 0000 0000 000d a74c
1337360 0300 493f 0000 4747 0000 000c 000d d180 000d d180 0001 0054 0000 0000 000d a77c 0400 493f 0000 4747 0000 0010 000d d1fc
1337440 000d d1fc 0001 0054 0000 0000 0000 002c 000f d864 b27c b66c 0000 0677 7fff ffff 000c f7e4 0200 0db5 0200 2f35 0000 4dff
1337520 0000 02e3 0000 315f 0000 002c 000f d890 b27c b66c 0000 0696 7fff ffff 000c f294 0200 0db5 0200 224d 0000 4dff 0000 4dbf
1337600 0000 315f 000f 7265 6163 6861 626c 655f 6e6f 6465 7300 0000 0000 002c 000c f2d4 b27c b66c 0000 0697 7fff ffff 0010 1f54
1337660 0200 0db5 0200 24bd 0000 3287 0000 4dbf 0000 315f 0000 002c 000c f8a8 b27c b66c 0000 067b 7fff ffff 0010 1f80 0200 0db5
1337740 0200 284d 0000 4dbf 0000 4dff 0000 315f 0000 0034 000c fc48 b27c b66c 0000 067c 7fff ffff 000d a8bc 0200 0db5 0400 242d
1340020 0000 503f 0000 0023 0000 4dbf 0000 21cf 0000 315f 0000 0034 000d a888 b27c b66c 0000 067d 7fff ffff 0010 1fac 0200 0db5
1340100 0400 242d 0000 43bf 0000 0023 0000 4dbf 0000 21cf 0000 315f 0000 003c 000d 8a5c b27c b66c 0000 067e 7fff ffff 000d a92c
1340160 0200 0db5 0200 2855 0400 503d 0000 Cab7 0000 001b 0000 0ad7 0000 4dbf 0000 315f 0000 003c 000d a8f0 b27c b66c
1340240 0000 067f 7fff ffff 000d a968 0200 0db5 0200 2855 0400 4dbd 0000 0ab7 0000 001b 0000 0ad7 0000 Cad7 0000 4dbf 0000 315f
1340320 0000 0040 000d a92c b27c b66c 0000 0680 7fff ffff 000d a9a8 0200 0db5 0200 2855 0500 5045 0000 0ab7 0000 0ab7 0000 001b
1340400 0000 0ab7 0000 0ad7 0000 4dbf 0000 315f 0000 003c 000d a968 b27c b66c 0000 0681 7fff ffff 000d a9e4 0200 0db5 0200 2855
1340460 0400 504d 0000 001b 0000 0ab7 0000 0ab7 0000 0ad7 0000 4dbf 0000 315f 0000 0038 000d a9a8 b27c b66c 0000 0682 7fff ffff
1340540 000d aa1c 0200 0db5 0200 2855 0300 5055 0000 0ab7 0000 001b 0000 0ad7 0000 4dbf 0000 315f 0000 003c 000d a9e4 b27c b66c
1340620 0000 0683 7fff ffff 0018 1fc8 0200 0db5 0200 2855 0400 505d 0000 0ab7 0000 0ab7 0000 001b 0000 0ad7 0000 4dbf 0000 315f
1340700 0000 0034 000f 62f4 b27c b66c 0000 0684 7fff ffff 000d aa8c 0200 0db5 0400 24ad 0000 3ad7 0000 0013 0000 4dbf 0000 3a8f
1340760 0000 315f 0000 0034 000d aa58 b27c b66c 0000 0686 7fff ffff 000d aac0 0200 0db5 0400 24ad 0000 1ea7 0000 0023 0000 4dbf
```

1341040 0000 1ea7 0000 315f 0000 0034 000d aa8c b27c b66c 0000 0687 7fff ffff 000a 27f4 0200 0db5 0400 24ad 0000 4837 0000 001b
1341120 0000 4dbf 0000 4747 0000 315f 000d acf0 0000 01d4 b288 b66c 0000 0685 7fff ffff 000d aac0 0200 0db5 0100 15ad 0100 33fd
1341200 0200 0b3d 0000 1ea7 0000 001b 0000 315f 000d ab58 0000 0034 b288 b66c 0000 0685 7fff ffff 000d aaf4 0200 0db5 0100 15ad
1341260 0100 33fd 0200 0b3d 0000 1ea7 0000 0023 0000 315f 000d ab8c 0000 0034 b288 b66c 0000 0685 7fff ffff 000d ab28 0200 0db5
1341340 0100 15ad 0100 33fd 0200 0b3d 0000 1ea7 0000 002b 0000 315f 000d abc0 0000 0034 b288 b66c 0000 0685 7fff ffff 000d ab5c
1341420 0200 0db5 0100 15ad 0100 33fd 0200 0b3d 0000 1ea7 0000 0033 0000 315f 000d abf4 0000 0034 b288 b66c 0000 0685 7fff ffff
1341500 000d ab90 0200 0db5 0100 15ad 0100 33fd 0200 0b3d 0000 1ea7 0000 003b 0000 315f 000d ac28 0000 0034 b288 b66c 0000 0685
1341560 7fff ffff 000d abc4 0200 0db5 0100 15ad 0100 33fd 0200 0b3d 0000 2fe7 0000 0023 0000 315f 000d ac60 0000 0038 b27c b66c
1341640 0000 0680 0000 0698 000d ac90 0200 0db5 0500 1cdd 0000 2def 0000 000b 0000 4dbf 0080 c363 0000 02e3 0000 315f 000d ac8c
1341720 0000 002c b4f0 b4e4 0000 0687 7fff ffff 0008 b0dd 0000 0000 0000 0000 000d b014 0002 438a 0010 1d30 000d acf0 0000 0038
1342000 b27c b66c 0000 068a 0000 0699 000d acf4 0200 0db5 0500 1cdd 0000 503f 0000 0023 0000 4dbf 007f be63 0000 02e3 0000 315f
1342060 2c78 002a 0002 438a 2520 4768 47a8 344c 33f4 247c 000f f7ec 001c 2ecc 3d18 4a7c 0014 3d00 4a7c 000c 723c 6162 000d ad6c
1342140 0000 0038 b27c b66c 0000 068b 0000 069a 000d ad70 0200 0db5 0500 1cdd 0000 4dbf 0000 0023 0000 4dbf 007f bf63 0000 02e3
1342220 0000 315f 2c78 0044 0002 438a 2520 46ec 4790 001c 47d0 33f4 35c8 3c9c 0000 001c 000d a644 0020 34c0 0018 4390 3858 382c
1342300 001c 40a0 0010 18ec 0018 386c 37f0 3cf4 242c 0000 0010 190c 000d ae28 0000 0038 b27c b66c 0000 068c 0000 069b 000d ae2c
1342360 0200 0db5 0500 1cdd 0000 5057 0000 001b 0000 4dbf 0080 c863 0000 02e3 0000 315f 2954 0084 0002 438a 56f8 687c 001c 6aa0
1342440 46ec 57b8 671c 6a50 5d10 0000 0200 0ad7 6af0 0020 6af0 0024 34a0 0028 4568 6e58 001c 5370 382c 001c 3c48 0000 0010 1950
1342520 002c 3e70 0028 43c0 0300 0e4f 6e58 0020 6e59 0024 5fa0 247c 000b 8888 0024 3430 3858 382c 0020 4538 6e58 001c 6e08 247c
1342600 0010 1970 0018 386c 37f0 3cf4 242c 0000 0010 190c 000d aeb4 0000 0038 b27c b66c 0000 068d 0000 069c 000d aeb8 0200 0db5
1342660 0500 1cdd 0000 5047 0000 002b 0000 4dbf 0080 c763 0000 02e3 0000 315f 2954 0054 0002 438a 56f8 687c 0020 69b0 46ec 4768
1342740 47e4 4880 0018 0024 34a0 001c 3858 382c 0020 3a4c 0010 19f0 0028 3984 0018 0024 447c 0000 0300 0e4f 6e58 0020 6d50 6e1c
1343020 001c 4580 6b74 6dd8 23fc 0000 0010 18ec 000d afa0 0000 00a8 b27c b66c 0000 068e 0000 069d 000d aef0 0200 0db5 0500 1cdd
1343100 0000 504f 0000 0023 0000 4dbf 0080 cf83 0000 02e3 0000 315f 000d af24 0000 0038 b27c b66c 0000 068f 0000 069e 000d af28
1343160 0200 0db5 0500 1cdd 0000 506f 0000 0013 0000 4dbf 0080 d363 0000 02e3 0000 315f 000d afa0 0000 0038 b27c b66c 0000 0690
1343240 0000 069f 000d afa4 0200 0db5 0500 1cdd 0000 506f 0000 0023 0000 4dbf 0080 ca83 0000 02e3 0000 315f 2954 0044 0002 438a
1343320 56f8 687c 001c 6af0 0020 46ec 4768 47e4 3858 382c 001c 3280 24d0 0000 0010 1b38 0024 3984 001c 0020 3984 0018 001c 38e8
1343400 386c 37f0 3cf4 234c 0010 1b58 000d b158 0000 00a8 b27c b66c 0000 0691 0000 06a0 003d afdc 0200 0db5 0500 1cdd 0000 507f
1343460 0000 001b 0000 4dbf 0080 d9c3 0000 02e3 0000 315f 000d b010 0000 0038 b27c b66c 0000 0692 0000 06a1 000d b014 0200 0db5
1343540 0500 1cdd 0000 506f 0000 0033 0000 4dbf 0080 dac3 0000 02e3 0000 315f 000d b158 0000 0038 b130 b66c 0000 0693 0000 06a2
1343620 000d ac65 0200 0db5 0500 1cdd 0000 505f 0000 0023 0000 4dbf 0080 cb83 0000 02e3 0000 315f 2954 0040 0002 438a 5d10 0000
1343700 0300 5ac7 4b8c 0000 0000 53df 671c 682c 4754 33d8 24d0 0000 0011 3cb0 0018 3d0c 56f8 4af8 0000 53df 6750 3858 2420 0000
1343760 0011 3cd0 28c4 0030 000d b0b4 56f8 6580 0018 5ec0 0000 0018 0300 0e4f 67ec 0018 5f8c 4938 0018 3050 3614 0018 239c 0000
1344040 0010 1970 28c4 0060 0010 1c78 56f8 671c 682c 5aec 0300 0e4f 671c 5fa0 6af0 0020 46ec 4768 5818 6750 6aa0 5b58 0300 0e4f
1344120 6b74 6d50 6af0 001c 38fc 001c 3858 35c8 3bf4 0000 0010 19f0 0024 382c 0020 37c4 001c 8d94 aab4 0000 a354 2ecc 23e4 0000
1344200 0010 1970 2c78 0040 0002 438a 2520 46d8 3348 35c8 31f0 247c 0011 15dc 0018 3d0c 56f8 4af8 0000 0df7 671c 332c 24d0 0000
1344260 0011 5420 0014 3d00 56f8 4af8 0000 0ddf 6d0c 723c 000d b264 0000 0070 b27c b66c 0000 0877 0000 096d 000d b194 0200 0db5
1344340 0500 1cdd 0000 5d47 0000 0013 0000 3287 008a ba83 0000 031b 0000 315f 000d b264 0000 0038 b27c b66c 0000 0878 0000 096e
1344420 000d b268 0200 0db5 0500 1cdd 0000 58df 0000 0013 0000 3287 0089 5243 0000 031b 0000 315f 2c78 009c 0002 438a 2520 46d8
1344500 56f8 4af8 0000 53d7 6750 3410 0020 31f0 2440 0000 0011 142c 0024 3df4 0020 56f8 4b8c 0000 0000 4837 6750 3410 001c 31f0
1344560 24d0 0000 0011 2c3c 0020 2ba0 0020 001c 37c4 001c 56f8 4af8 0000 0de7 55f0 4af8 0000 0df7 6aa0 2c88 0014 2c58 3df4 001c
1344640 56f8 4af8 0000 54bf 6aa0 bfcc 3348 3aa0 0011 2c5c 0018 332c 40f4 0000 0011 5fbc 0014 3d00 56f8 4af8 0000 0ddf 6d0c 723c
1344720 000d b30c 0000 0038 b27c b66c 0000 0879 0000 096f 000d b310 0200 0db5 0500 1cdd 0000 5def 0000 0013 0000 3287 008a fde3
1345000 0000 031b 0000 315f 27f0 002c 000d b2c4 2520 46d8 332c 247c 0011 2d08 0014 3d00 56f8 4af8 0000 53c7 671c 37dc 242c 0000
1345060 0011 25c8 2954 0044 0002 438a 2520 46d8 3348 247c 0011 5fbc 0018 3d0c 56f8 4af8 0000 0abf 671c 332c 24d0 0000 0011 2d08
1345140 0014 3d00 56f8 4af8 0000 53c7 671c 37dc 242c 0000 0011 25c8 000d b3ac 0000 0070 b27c b66c 0000 087a 0000 0970 000d b348
1345220 0200 0db5 0500 1cdd 0000 54f7 0000 0013 0000 3287 008b 0023 0000 031b 0000 315f 000d b3ac 0000 0038 b27c b66c 0000 087b
1345300 0000 0971 000d b3b0 0200 0db5 0500 1cdd 0000 5497 0000 0013 0000 3287 008a d5c3 0000 031b 0000 315f 2954 0030 0002 438a
1345360 2520 46d8 33bc 35c8 31f0 247c 0011 144c 0014 3100 56f8 4af8 0000 0abf 671c 37dc 242c 0000 0011 5ab8 000d b4ac 0000 0070
1345440 b27c b66c 0000 087c 0000 0972 000d b3e8 0200 0db5 0500 1cdd 0000 585f 0000 0013 0000 3287 0089 2f43 0000 031b 0000 315f
1345520 000d b4ac 0000 0038 b27c b66c 0000 087d 0000 0973 000d b4b0 0200 0db5 0500 1cdd 0000 5db7 0000 0013 0000 3287 008a dc63
1345600 0000 031b 0000 315f 2c78 0090 0002 438a 45b8 46ec 2ba0 0014 0010 37f0 3b4c 0000 0011 6124 0014 2eb0 2c30 000e 37f0 39a4
1345660 0011 4580 0014 2eb0 2c30 000e 37f0 39a4 0011 2998 0014 2eb0 2c30 000e 37f0 39a4 0011 6144 0014 2eb0 2c30 000e 37f0 39a4
1345740 0011 504c 0014 2eb0 2c30 000e 37f0 39a4 0011 5240 0014 2eb0 2c30 000e 37f0 39a4 0011 5de4 0014 2eb0 2c58 37f0 3b4c 0000
1346020 0011 5344 000c 2eb0 000d b514 0000 0038 b27c b66c 0000 087e 0000 0974 000d b518 0200 0db5 0500 1cdd 0000 5e0f 0000 0013
1346100 0000 3287 008b 0b83 0000 031b 0000 315f 2c78 0030 0002 438a 45c4 46d8 2ba0 0014 0010 3788 56f8 4af8 0000 0ab7 6d0c 723c

| | | | | | | | | | | | | | | | | | | | | | | | | |
|---|---|---|---|---|---|---|---|---|---|---|---|---|---|---|---|---|---|---|---|---|---|---|---|---|
| 1346160 | 2c58 | 3788 | 56f8 | 4af8 | 0000 | 0ad7 | 6d0c | 723c | 000d | b808 | 0000 | 0038 | b27c | b66c | 0000 | 087f | 0000 | 0975 | 000d | b80c | 0200 | 0db5 | 0500 | 1cdd |
| 1346240 | 0000 | 5e07 | 0000 | 0013 | 0000 | 3287 | 008b | 0a23 | 0000 | 031b | 0000 | 315f | 27f0 | 007c | 000d | b5c4 | 2520 | 4700 | 3410 | 0020 | 35c8 | 3280 | 24d0 | 0000 |
| 1346320 | 0011 | 2c3c | 0024 | 2ba0 | 0024 | 001e | 37c4 | 0020 | 56f8 | 4af8 | 0000 | 0de7 | 55f0 | 4af8 | 0000 | 0df7 | 6af0 | 001c | 2c88 | 0018 | 2c58 | 3df4 | 0020 | 56f8 |
| 1346400 | 4b8c | 0000 | 0000 | 54bf | 6af0 | 001c | bfcc | 33f4 | 382c | 001c | 329c | 247c | 0011 | 61cc | 001c | 3d18 | 56f8 | 4af8 | 0000 | 0ddf | 6d94 | 3d30 | 3cf4 | 234c |
| 1346460 | 0011 | 61ec | 2954 | 0240 | 0002 | 438a | 2520 | 46d8 | 33f4 | 35c8 | 31f0 | 247c | 0011 | 2c3c | 001c | 2ba0 | 001c | 001c | 37b0 | 56f8 | 4b8c | 0000 | 0000 | 0de7 |
| 1346540 | 55f0 | 4af8 | 0000 | 0df7 | 6a50 | 2c88 | 0014 | 2c58 | 3d18 | 56f8 | 4b8c | 0000 | 0000 | 54bf | 6a50 | bfcc | 379c | 56f8 | 4b8c | 0000 | 0000 | 539f | 6750 | 33bc |
| 1346620 | 31f0 | 247c | 0011 | 61cc | 0014 | 3d00 | 56f8 | 4af8 | 0000 | 0ddf | 6d0c | 4550 | 4b8c | 0000 | 0000 | 03cb | 5370 | 4538 | 4b8c | 0000 | 0000 | 030b | 6bb4 | 4550 |
| 1346700 | 4b8c | 0000 | 0000 | 0363 | 6b74 | 4538 | 4b8c | 0000 | 0000 | 032b | 6bb4 | 4550 | 4b8c | 0000 | 0000 | 0323 | 6b74 | 4538 | 4b8c | 0000 | 0000 | 0103 | 6bb4 | 4550 |
| 1346760 | 4b8c | 0000 | 0000 | 03a3 | 6b74 | 4538 | 4b8c | 0000 | 0000 | 0393 | 6bb4 | 4550 | 4b8c | 0000 | 0000 | 037b | 6b74 | 4538 | 4b8c | 0000 | 0000 | 0383 | 6bb4 | 4550 |
| 1347040 | 4b8c | 0000 | 0000 | 039b | 6b74 | 4538 | 4b8c | 0000 | 0000 | 0373 | 6bb4 | 4550 | 4b8c | 0000 | 0000 | 030b | 6b74 | 4538 | 4b8c | 0000 | 0000 | 0393 | 6bb4 | 4550 |
| 1347120 | 4b8c | 0000 | 0000 | 03a3 | 6b74 | 4538 | 4b8c | 0000 | 0000 | 0103 | 6bb4 | 4550 | 4b8c | 0000 | 0000 | 0343 | 6b74 | 4538 | 4b8c | 0000 | 0000 | 03a3 | 6bb4 | 4550 |
| 1347200 | 4b8c | 0000 | 0000 | 034b | 6b74 | 4538 | 4b8c | 0000 | 0000 | 03bb | 6bb4 | 4550 | 4b8c | 0000 | 0000 | 0103 | 6b74 | 4538 | 4b8c | 0000 | 0000 | 03a3 | 6bb4 | 4550 |
| 1347260 | 4b8c | 0000 | 0000 | 0373 | 6b74 | 4538 | 4b8c | 0000 | 0000 | 032b | 6bb4 | 4550 | 4b8c | 0000 | 0000 | 036b | 6b74 | 4538 | 4b8c | 0000 | 0000 | 0373 | 6bb4 | 4550 |
| 1347340 | 4b8c | 0000 | 0000 | 033b | 6b74 | 4538 | 4b8c | 0000 | 0000 | 034b | 6bb4 | 4550 | 4b8c | 0000 | 0000 | 039b | 6b74 | 4538 | 4b8c | 0000 | 0000 | 039b | 6bb4 | 4550 |
| 1347420 | 4b8c | 0000 | 0000 | 030b | 6b74 | 4538 | 4b8c | 0000 | 0000 | 02fb | 6bb4 | 4550 | 4b8c | 0000 | 0000 | 0363 | 6b74 | 4538 | 4b8c | 0000 | 0000 | 030b | 6bb4 | 4550 |
| 1347500 | 4b8c | 0000 | 0000 | 0373 | 6b74 | 4538 | 4b8c | 0000 | 0000 | 033b | 6bb4 | 4550 | 4b8c | 0000 | 0000 | 034b | 6b74 | 4538 | 4b8c | 0000 | 0000 | 039b | 6bb4 | 234c |
| 1347560 | 0011 | 19bc | 000d | ba3c | 0000 | 0038 | b27c | b66c | 0000 | 0880 | 0000 | 0976 | 000d | ba40 | 0200 | 0db5 | 0500 | 1cdd | 0000 | 57d7 | 0000 | 0013 | 0000 | 3287 |
| 1347640 | 0089 | 1003 | 0000 | 031b | 0000 | 315f | 2c78 | 01fc | 0002 | 438a | 2520 | 4714 | 56f8 | 4af8 | 0000 | 537f | 6750 | 3410 | 002c | 3280 | 24d0 | 0000 | 0011 | 2f38 |
| 1347720 | 0030 | 3df4 | 002c | 56f8 | 4b8c | 0000 | 0000 | 0daf | 6750 | 3410 | 0028 | 32b8 | 24d0 | 0000 | 0011 | 13ec | 002c | 2ba0 | 002c | 001a | 329c | 4c70 | 0000 | 323f |
| 1350000 | 37c4 | 0028 | 31d4 | 0024 | 4a7c | 0024 | 2c88 | 0018 | 2c58 | 3410 | 0024 | 3e70 | 0028 | 329c | 24d0 | 0000 | 0011 | 6248 | 0028 | 2ba0 | 0028 | 0012 | 37c4 | 0024 |
| 1350060 | 31d4 | 001c | 4a7c | 001c | 2c88 | 0150 | 2c30 | 001e | 37c4 | 0024 | 56f8 | 4af8 | 0000 | 0daf | 55f0 | 4af8 | 0000 | 0df7 | 6af0 | 0020 | 2c88 | 0018 | 2c58 | 3df4 |
| 1350140 | 0024 | 56f8 | 4b8c | 0000 | 0000 | 0dd7 | 6af0 | 0020 | bfcc | 3410 | 001c | 382c | 0020 | 31f0 | 24d0 | 0000 | 0011 | 142c | 0020 | 4538 | 4b8c | 0000 | 0000 | 0373 |
| 1350220 | 5370 | 4550 | 4b8c | 0000 | 0000 | 037b | 6b74 | 4538 | 4b8c | 0000 | 0000 | 034b | 6bb4 | 4550 | 4b8c | 0000 | 0000 | 03a3 | 6b74 | 4538 | 4b8c | 0000 | 0000 | 030b |
| 1350300 | 6bb4 | 4550 | 4b8c | 0000 | 0000 | 03d3 | 6b74 | 4538 | 4b8c | 0000 | 0000 | 034b | 6bb4 | 4550 | 4b8c | 0000 | 0000 | 0363 | 6b74 | 4538 | 4b8c | 0000 | 0000 | 030b |
| 1350360 | 6bb4 | 4550 | 4b8c | 0000 | 0000 | 034b | 6b74 | 4538 | 4b8c | 0000 | 0000 | 03a3 | 6bb4 | 4550 | 4b8c | 0000 | 0000 | 034b | 6b74 | 4538 | 4b8c | 0000 | 0000 | 0373 |
| 1350440 | 6bb4 | 4550 | 4b8c | 0000 | 0000 | 034b | 6b74 | 4538 | 4b8c | 0000 | 0000 | 0103 | 6bb4 | 4550 | 4b8c | 0000 | 0000 | 0363 | 6b74 | 4538 | 4b8c | 0000 | 0000 | 030b |
| 1350520 | 6bb4 | 4550 | 4b8c | 0000 | 0000 | 0373 | 6b74 | 4538 | 4b8c | 0000 | 0000 | 033b | 6bb4 | 4550 | 4b8c | 0000 | 0000 | 034b | 6b74 | 4538 | 4b8c | 0000 | 0000 | 039b |
| 1350600 | 6bb4 | 247c | 0011 | 3abc | 0020 | 3df4 | 001c | 56f8 | 4b8c | 0000 | 0000 | 0ddf | 6dd8 | 3d6c | 3d30 | 3cf4 | 242c | 0000 | 0011 | 6268 | 000d | bac0 | 0000 | 0038 |
| 1350660 | b27c | b66c | 0000 | 0881 | 0000 | 0977 | 000d | bac4 | 0200 | 0db5 | 0500 | 1cdd | 0000 | 5e1f | 0000 | 001b | 0000 | 3287 | 008b | 1243 | 0000 | 031b | 0000 | 315f |
| 1350740 | 2c78 | 004a | 0002 | 438a | 45b8 | 4700 | 4754 | 2ba0 | 0018 | 001c | 379c | 56f8 | 4b8c | 0000 | 0000 | 5357 | 6d50 | 3774 | 4e1c | 0000 | 0000 | 5357 | 723c | 2c58 |
| 1351020 | 379c | 56f8 | 4b8c | 0000 | 0000 | 526f | 6150 | 3774 | 4e1c | 0000 | 0000 | 526f | 723c | 732c | 000d | bb3c | 0000 | 0038 | b27c | b66c | 0000 | 0882 | 0000 | 0978 |
| 1351100 | 000d | bb40 | 0200 | 0db5 | 0500 | 1cdd | 0000 | 5b97 | 0000 | 0013 | 0000 | 3287 | 008a | 2203 | 0000 | 031b | 0000 | 315f | 2c78 | 0044 | 0002 | 438a | 45c4 | 46d8 |
| 1351160 | 2ba0 | 0014 | 0010 | 3844 | 37f0 | 31f0 | 242c | 0000 | 0011 | 51a8 | 2c30 | 0012 | 3788 | 56f8 | 4b8c | 0000 | 0000 | 531f | 6d0c | 723c | 2c58 | 3788 | 56f8 | 4af8 |
| 1351240 | 0000 | 1ccf | 6d0c | 723c | 000d | bc04 | 0000 | 0070 | b27c | b66c | 0000 | 0883 | 0000 | 0979 | 000d | bb78 | 0200 | 0db5 | 0500 | 1cdd | 0000 | 587f | 0000 | 001b |
| 1351320 | 0000 | 3287 | 0089 | 3843 | 0000 | 031b | 0000 | 315f | 000d | bc04 | 0000 | 0038 | b27c | b66c | 0000 | 0884 | 0000 | 097a | 000d | bc08 | 0200 | 0db5 | 0500 | 1cdd |
| 1351400 | 0000 | 5e2f | 0000 | 001b | 0000 | 3287 | 008b | 1743 | 0000 | 031b | 0000 | 315f | 2954 | 0058 | 0002 | 438a | 45dc | 4790 | 0020 | 3410 | 0024 | 329c | 24d0 | 0000 |
| 1351460 | 0011 | 634c | 0028 | 3410 | 001c | 3e70 | 0024 | 32b8 | 24d0 | 0000 | 0011 | 152c | 0024 | 3894 | 0020 | 3e70 | 001c | 3280 | 24d0 | 0000 | 0011 | 62e8 | 001c | 37b0 |
| 1351540 | 5d10 | 0000 | 0300 | 5ac7 | 6d94 | 6d50 | 6d0c | 723c | 000d | bcb0 | 0000 | 0070 | b27c | b66c | 0000 | 0885 | 0000 | 097b | 000d | bc40 | 0200 | 0db5 | 0500 | 1cdd |
| 1351620 | 0000 | 5677 | 0000 | 001b | 0000 | 3287 | 0088 | baa3 | 0000 | 031b | 0000 | 315f | 000d | bcb0 | 0000 | 0038 | b27c | b66c | 0000 | 0886 | 0000 | 097c | 000d | bcb4 |
| 1351700 | 0200 | 0db5 | 0500 | 1cdd | 0000 | 5e37 | 0000 | 0013 | 0000 | 3287 | 008b | 1ce3 | 0000 | 031b | 0000 | 315f | 2c78 | 003c | 0002 | 438a | 2520 | 46d8 | 3348 | 247c |
| 1351760 | 0011 | 63cc | 0018 | 310c | 56f8 | 4af8 | 0000 | 0a0f | 671c | 332c | 24d0 | 0000 | 0011 | 2728 | 0014 | 3d00 | 56f8 | 4af8 | 0000 | 0a7f | 6d0c | 723c | 000d | bd18 |
| 1352040 | 0000 | 0038 | b27c | b66c | 0000 | 0887 | 0000 | 097d | 000d | bd1c | 0200 | 0db5 | 0500 | 1cdd | 0000 | 5c97 | 0000 | 001b | 0000 | 3287 | 008a | a543 | 0000 | 031b |
| 1352120 | 0000 | 315f | 2c78 | 0030 | 0002 | 438a | 2520 | 4740 | 5758 | 4af8 | 0000 | 0857 | 6750 | 33bc | 24d0 | 0000 | 0011 | 63fc | 0014 | 3d00 | 56f8 | 4af8 | 0000 | 0857 |
| 1352200 | 6d0c | 723c | 000d | bde0 | 0000 | 0038 | b27c | b66c | 0000 | 0888 | 0000 | 097e | 000d | bde4 | 0200 | 0db5 | 0500 | 1cdd | 0000 | 57bf | 0000 | 0013 | 0000 | 3287 |
| 1352260 | 0089 | 0d03 | 0000 | 031b | 0000 | 315f | 2c78 | 0090 | 0002 | 438a | 2520 | 4714 | 3410 | 0024 | 35c8 | 3280 | 24d0 | 0000 | 0011 | 6484 | 0028 | 3df4 | 0024 | 56f8 |
| 1352340 | 4b8c | 0000 | 0000 | 25d7 | 671c | 3380 | 0020 | 247c | 0011 | 64a4 | 0024 | 3df4 | 0020 | 56f8 | 4b8c | 0000 | 0000 | 524f | 671c | 3380 | 001c | 247c | 0011 | 64c4 |
| 1352420 | 0020 | 3df4 | 001c | 56f8 | 4b8c | 0000 | 0000 | 52af | 6a50 | 2ba0 | 001c | 000a | 379c | 4a7c | 0018 | 723c | 2c58 | 3880 | 3804 | 329c | 24d0 | 0000 | 0011 | 334c |
| 1352500 | 0014 | 3d30 | 3cf4 | 234c | 0011 | 1774 | 000d | bedc | 0000 | 0070 | b27c | b66c | 0000 | 0889 | 0000 | 097f | 000d | be1c | 0200 | 0db5 | 0500 | 1cdd | 0000 | 57b7 |
| 1352560 | 0000 | 0013 | 0000 | 3287 | 0089 | 0c03 | 0000 | 031b | 0000 | 315f | 000d | bedc | 0000 | 0038 | b27c | b66c | 0000 | 088a | 0000 | 0980 | 000d | bee0 | 0200 | 0db5 |
| 1352640 | 0500 | 1cdd | 0000 | 5e57 | 0000 | 0013 | 0000 | 3287 | 008b | 2943 | 0000 | 031b | 0000 | 315f | 2c78 | 008c | 0002 | 438a | 45b8 | 46ec | 2ba0 | 0014 | 0008 | 2330 |
| 1352720 | 0011 | 2180 | 2c30 | 000a | 2410 | 0000 | 0011 | 21a0 | 2c30 | 000a | 2410 | 0000 | 0011 | 2160 | 2c30 | 000a | 2410 | 0000 | 0011 | 21c0 | 2c30 | 000a | 2410 | 0000 |
| 1353000 | 0011 | 21e0 | 2c30 | 000a | 2410 | 0000 | 0011 | 5468 | 2c30 | 000a | 2410 | 0000 | 0011 | 2220 | 2c30 | 000a | 2410 | 0000 | 0011 | 15bc | 2c30 | 000a | 2410 | 0000 |
| 1353060 | 0011 | 1a64 | 2c30 | 000a | 2410 | 0000 | 0011 | 1b78 | 2c58 | 2330 | 0011 | 22a0 | 000d | c030 | 0000 | 0070 | b27c | b66c | 0000 | 088b | 0000 | 0981 | 000d | bf18 |
| 1353140 | 0200 | 0db5 | 0500 | 1cdd | 0000 | 5e47 | 0000 | 0013 | 0000 | 3287 | 008b | 2523 | 0000 | 031b | 0000 | 315f | 000d | c030 | 0000 | 0038 | b27c | b66c | 0000 | 088c |
| 1353220 | 0000 | 0982 | 000d | c034 | 0200 | 0db5 | 0500 | 1cdd | 0000 | 5e3f | 0000 | 001b | 0000 | 3287 | 008b | 2423 | 0000 | 031b | 0000 | 315f | 2c78 | 00e4 | 0002 | 438a |

| | | | | | | | | | | | | | | | | | | | | | | | | |
|---|---|---|---|---|---|---|---|---|---|---|---|---|---|---|---|---|---|---|---|---|---|---|---|---|
| 1353300 | 45e8 | 001c | 4728 | 0020 | 4740 | 2ba0 | 002c | 005e | 37c4 | 0020 | 56f8 | 4af8 | 0000 | 533f | 6750 | 3410 | 0028 | 3c9c | 0060 | c01c | 0011 | 334c | 002c | 2ba0 |
| 1353360 | 002c | 000c | 37c4 | 0028 | 4a7c | 000c | 723c | 2c58 | 3df4 | 0028 | 56f8 | 4af8 | 0000 | 0a0f | 671c | 3380 | 0024 | 247c | 0011 | 3fec | 0028 | 3df4 | 0024 | 56f8 |
| 1353440 | 4b8c | 0000 | 0000 | 0a7f | 6d0c | 723c | 2c58 | 37c4 | 0020 | 55f8 | 4b9c | 0000 | 0000 | 52c7 | 6750 | 33f4 | 3af4 | 001c | 0011 | 334c | 001c | 2ba0 | 001c | 000e |
| 1353520 | 37b0 | 318c | 4a7c | 0010 | 2c88 | 002a | 2c58 | 3d18 | 56f8 | 4af8 | 0000 | 0a0f | 671c | 3348 | 24d0 | 0000 | 0011 | 3fec | 0018 | 3d0c | 56f8 | 4af8 | 0000 | 0a7f |
| 1353600 | 6a00 | bfcc | 3788 | 56f8 | 4b8c | 0000 | 0000 | 536f | 6750 | 3944 | 31f0 | 234c | 0011 | 1a94 | 000d | c0e8 | 0000 | 0070 | b27c | b66c | 0000 | 098d | 0000 | 0983 |
| 1353660 | 000d | c06c | 0200 | 0db5 | 0500 | 1cdd | 0000 | 5e4f | 0000 | 0013 | 0000 | 3287 | 008b | 2623 | 0000 | 031b | 0000 | 315f | 000d | c0e8 | 0000 | 0038 | b27c | b66c |
| 1353740 | 0000 | c88e | 0000 | 0984 | 000d | c0ec | 0200 | 0db5 | 0500 | 1cdd | 0000 | 57c7 | 0000 | 0013 | 0000 | 3287 | 0089 | 0e03 | 0000 | 031b | 0000 | 315f | 2c78 | 0048 |
| 1354020 | 0002 | 438a | 2520 | 46d8 | 56f8 | 4af8 | 0000 | 5387 | 6750 | 33d8 | 31f0 | 247c | 0011 | 15dc | 0018 | 3d0c | 56f8 | 4af8 | 0000 | 25d7 | 6750 | 33bc | 31f0 | 247c |
| 1354100 | 0011 | 13ec | 0014 | 3400 | 56f8 | 4af8 | 0000 | 0ddf | 6d0c | 723c | 000d | c560 | 0000 | 0038 | b27c | b66c | 0000 | 088f | 0000 | 0985 | 000d | c564 | 0200 | 0db5 |
| 1354160 | 0500 | 1cdd | 0000 | 55e7 | 0000 | 001b | 0000 | 3287 | 0089 | 9f63 | 0000 | 031b | 0000 | 315f | 27f0 | 028c | 000d | c3a8 | 45d0 | 4754 | 33f4 | 3a4c | 0011 | 144c |
| 1354240 | 001c | 33a0 | 3d48 | 3a4c | 0011 | 144c | 0014 | 37f0 | 40cc | 0000 | 0011 | 2fc0 | 000c | 4550 | 4b8c | 0000 | 0000 | 03a3 | 5370 | 4538 | 4b8c | 0000 | 0000 | 0373 |
| 1354320 | 6bb4 | 4550 | 4b8c | 0000 | 0000 | 034b | 6b74 | 4538 | 4b8c | 0000 | 0000 | 030b | 6bb4 | 4550 | 4b8c | 0000 | 0000 | 0393 | 6b74 | 4538 | 4b8c | 0000 | 0000 | 03a3 |
| 1354400 | 6bb4 | 4550 | 4b8c | 0000 | 0000 | 039b | 6b74 | 4538 | 4b8c | 0000 | 0000 | 0373 | 6bb4 | 4550 | 4b8c | 0000 | 0000 | 037b | 6b74 | 4538 | 4b8c | 0000 | 0000 | 031b |
| 1354460 | 6bb4 | 4550 | 4b8c | 0000 | 0000 | 0103 | 6b74 | 4538 | 4b8c | 0000 | 0000 | 030b | 6bb4 | 4550 | 4b8c | 0000 | 0000 | 0103 | 6b74 | 4538 | 4b8c | 0000 | 0000 | 0323 |
| 1354540 | 6bb4 | 4550 | 4b8c | 0000 | 0000 | 0373 | 6b74 | 4538 | 4b8c | 0000 | 0000 | 030b | 6bb4 | 4550 | 4b8c | 0000 | 0000 | 0103 | 6b74 | 4538 | 4b8c | 0000 | 0000 | 039b |
| 1354620 | 6bb4 | 4550 | 4b8c | 0000 | 0000 | 032b | 6b74 | 4538 | 4b8c | 0000 | 0000 | 036b | 6bb4 | 4550 | 4b8c | 0000 | 0000 | 030b | 6b74 | 4538 | 4b8c | 0000 | 0000 | 0373 |
| 1354700 | 6bb4 | 4550 | 4b8c | 0000 | 0000 | 0103 | 6b74 | 4538 | 4b8c | 0000 | 0000 | 037b | 6bb4 | 4550 | 4b8c | 0000 | 0000 | 03bb | 6b74 | 4538 | 4b8c | 0000 | 0000 | 03a3 |
| 1354760 | 6bb4 | 4550 | 4b8c | 0000 | 0000 | 0103 | 6b74 | 4538 | 4b8c | 0000 | 0000 | 0343 | 6bb4 | 4550 | 4b8c | 0000 | 0000 | 03a3 | 6b74 | 4538 | 4b8c | 0000 | 0000 | 034b |
| 1355040 | 6bb4 | 4550 | 4b8c | 0000 | 0000 | 03bb | 6b74 | 4538 | 4b8c | 0000 | 0000 | 0103 | 6bb4 | 4550 | 4b8c | 0000 | 0000 | 0373 | 6b74 | 4538 | 4b8c | 0000 | 0000 | 037b |
| 1355120 | 6bb4 | 4550 | 4b8c | 0000 | 0000 | 034b | 6b74 | 4538 | 4b8c | 0000 | 0000 | 03a3 | 6bb4 | 4550 | 4b8c | 0000 | 0000 | 030b | 6b74 | 4538 | 4b8c | 0000 | 0000 | 031b |
| 1355200 | 6bb4 | 4550 | 4b8c | 0000 | 0000 | 034b | 6b74 | 4538 | 4b8c | 0000 | 0000 | 0323 | 6bb4 | 4550 | 4b8c | 0000 | 0000 | 0373 | 6b74 | 4538 | 4b8c | 0000 | 0000 | 034b |
| 1355260 | 6bb4 | 4550 | 4b8c | 0000 | 0000 | 02fb | 6b74 | 4538 | 4b8c | 0000 | 0000 | 032b | 6bb4 | 4550 | 4b8c | 0000 | 0000 | 0383 | 6b74 | 4538 | 4b8c | 0000 | 0000 | 03cb |
| 1355340 | 6bb4 | 4550 | 4b8c | 0000 | 0000 | 03a3 | 6b74 | 4538 | 4b8c | 0000 | 0000 | 0313 | 6bb4 | 4550 | 4b8c | 0000 | 0000 | 03ab | 6b74 | 4538 | 4b8c | 0000 | 0000 | 039b |
| 1355420 | 6bb4 | 234c | 0011 | 19bc | 28c4 | 01b4 | 0011 | 65f0 | 45b8 | 4768 | 33bc | 39a4 | 0011 | 144c | 0018 | 386c | 3d30 | 39a4 | 0011 | 144c | 000c | 4538 | 4b8c | 0000 |
| 1355500 | 0000 | 039b | 5370 | 4550 | 4b8c | 0000 | 0000 | 032b | 6b74 | 4538 | 4b8c | 0000 | 0000 | 036b | 6bb4 | 4550 | 4b8c | 0000 | 0000 | 030b | 6b74 | 4538 | 4b8c | 0000 |
| 1355560 | 0000 | 0373 | 6bb4 | 4550 | 4b8c | 0000 | 0000 | 0103 | 6b74 | 4538 | 4b8c | 0000 | 0000 | 037b | 6bb4 | 4550 | 4b8c | 0000 | 0000 | 03bb | 6b74 | 4538 | 4b8c | 0000 |
| 1355640 | 0000 | 03a3 | 6bb4 | 4550 | 4b8c | 0000 | 0000 | 0103 | 6b74 | 4538 | 4b8c | 0000 | 0000 | 0343 | 6bb4 | 4550 | 4b8c | 0000 | 0000 | 03a3 | 6b74 | 4538 | 4b8c | 0000 |
| 1355720 | 0000 | 034b | 6bb4 | 4550 | 4b8c | 0000 | 0000 | 03bb | 6b74 | 4538 | 4b8c | 0000 | 0000 | 0103 | 6bb4 | 4550 | 4b8c | 0000 | 0000 | 0373 | 6b74 | 4538 | 4b8c | 0000 |
| 1356000 | 0000 | 037b | 6bb4 | 4550 | 4b8c | 0000 | 0000 | 034b | 6b74 | 4538 | 4b8c | 0000 | 0000 | 03a3 | 6bb4 | 4550 | 4b8c | 0000 | 0000 | 030b | 6b74 | 4538 | 4b8c | 0000 |
| 1356060 | 0000 | 031b | 6bb4 | 4550 | 4b8c | 0000 | 0000 | 034b | 6b74 | 4538 | 4b8c | 0000 | 0000 | 0323 | 6bb4 | 4550 | 4b8c | 0000 | 0000 | 0373 | 6b74 | 4538 | 4b8c | 0000 |
| 1356140 | 0000 | 034b | 6bb4 | 4550 | 4b8c | 0000 | 0000 | 02fb | 6b74 | 4538 | 4b8c | 0000 | 0000 | 032b | 6bb4 | 4550 | 4b8c | 0000 | 0000 | 0383 | 6b74 | 4538 | 4b8c | 0000 |
| 1356220 | 0000 | 03cb | 6bb4 | 4550 | 4b8c | 0000 | 0000 | 03a3 | 6b74 | 4538 | 4b8c | 0000 | 0000 | 0313 | 6bb4 | 4550 | 4b8c | 0000 | 0000 | 03ab | 6b74 | 4538 | 4b8c | 0000 |
| 1356300 | 0000 | 039b | 6bb4 | 234c | 0011 | 19bc | 000d | c5f4 | 0000 | 0038 | b27c | b66c | 0000 | 0890 | 0000 | 0986 | 000d | c5f8 | 0200 | 0db5 | 0500 | 1cdd | 0000 | 5e5f |
| 1356360 | 0000 | 001b | 0000 | 3287 | 008b | 31e3 | 0000 | 031b | 0000 | 315f | 2c78 | 005a | 0002 | 438a | 45b8 | 4700 | 4754 | 2ba0 | 0018 | 000e | 3858 | 3804 | 2420 | 0000 |
| 1356440 | 0011 | 1754 | 2c30 | 000e | 3858 | 3804 | 2420 | 0000 | 0011 | 666c | 2c30 | 000e | 3858 | 3804 | 2420 | 0000 | 0011 | 33a0 | 2c58 | 379c | 56f8 | 4af8 | 0000 | 1ccf |
| 1356520 | 6d50 | 3774 | 4e1c | 000c | 000c | 1ccf | 723c | 7468 | 000d | c6bc | 0000 | 0070 | b27c | b66c | 0000 | 0891 | 0000 | 0987 | 000d | c630 | 0200 | 0db5 | 0500 | 1cdd |
| 1356600 | 0000 | 5907 | 0000 | 001b | 0000 | 3287 | 0089 | 61e3 | 0000 | 031b | 0000 | 315f | 000d | c6bc | 0000 | 0038 | b27c | b66c | 0000 | 0892 | 0000 | 0988 | 000d | c6c0 |
| 1356660 | 0200 | 0db5 | 0500 | 1cdd | 0000 | 307f | 0000 | 001b | 0000 | 3287 | 008b | 1a63 | 0000 | 031b | 0000 | 315f | 2954 | 0058 | 0002 | 438a | 45dc | 4790 | 0020 | 3410 |
| 1356740 | 0024 | 329c | 24d0 | 0000 | 0011 | 3ddc | 0028 | 3410 | 001c | 3e70 | 0024 | 32b8 | 24d0 | 0000 | 0011 | 5130 | 0024 | 3894 | 0020 | 3e70 | 001c | 3280 | 24d0 | 0000 |
| 1357020 | 0011 | 634c | 001c | 37b0 | 5d10 | 0000 | 0100 | 5ac7 | 6d94 | 6d50 | 6d0c | 723c | 000d | c76c | 0000 | 0070 | b27c | b66c | 0000 | 0893 | 0000 | 0989 | 000d | c6f8 |
| 1357100 | 0200 | 0db5 | 0500 | 1cdd | 0000 | 5e67 | 0000 | 0013 | 0000 | 3287 | 008b | 3703 | 0000 | 031b | 0000 | 315f | 000d | c76c | 0000 | 0038 | b27c | b66c | 0000 | 0894 |
| 1357160 | 0000 | 098a | 000d | c770 | 0200 | 0db5 | 0500 | 1cdd | 0000 | 5e6f | 0000 | 0013 | 0000 | 3287 | 008b | 3b23 | 0000 | 031b | 0000 | 315f | 2c78 | 0040 | 0002 | 438a |
| 1357240 | 2520 | 46d8 | 33d8 | 35c8 | 31f0 | 247c | 0011 | 1a84 | 0018 | 3d0c | 56f8 | 4af8 | 0000 | 0a0f | 6750 | 33bc | 31f0 | 247c | 0011 | 142c | 0014 | 3d00 | 56f8 | 4af8 |
| 1357320 | 0000 | 0a7f | 6d0c | 723c | 000d | d844 | 0000 | 0038 | b27c | b66c | 0000 | 0895 | 0000 | 098b | 0010 | 9430 | 0200 | 0db5 | 0500 | 1cdd | 0000 | 57af | 0000 | 0013 |
| 1357400 | 0000 | 3287 | 0089 | 0b03 | 0000 | 031b | 0000 | 315f | 2c78 | 0024 | 0002 | 438a | 45b8 | 46ec | 4768 | 2ba0 | 0018 | 000a | 23fc | 0000 | 0011 | 144c | 2c58 | 231c |
| 1357460 | 0011 | 144c | 000d | 6f18 | 000b | 3efc | 001b | 2240 | 2823 | 2939 | 332f | 3031 | 2f30 | 3320 | 7365 | 7473 | 2e70 | 6c09 | 3336 | 2e31 | 2200 | 0abf | 000d | 69b4 |
| 1357540 | 0100 | 2def | 0000 | 4747 | 0000 | 0004 | 000d | c834 | 000d | c834 | 0001 | 0054 | 0000 | 0000 | 0000 | 0028 | 000d | 69ec | b27c | b66c | 0000 | 03b6 | 7fff | ffff |
| 1357620 | 000e | 1978 | 0200 | 0db5 | 0100 | 32b5 | 0000 | 4747 | 0000 | 315f | 2cac | 01b7 | 0002 | 438a | 2ca0 | cccd | 0000 | 0000 | 0000 | 0001 | 000d | 7c10 | 000d | 7c10 |
| 1357700 | 0002 | 438a | 000d | c858 | 000d | 7c1c | 0002 | 7073 | 0000 | 03ef | 000a | 3fe8 | 0000 | 0000 | 27f0 | 0024 | 000d | 6bb4 | 2520 | 46ec | 4740 | 37f0 | 24d0 | 0000 |
| 1357760 | 000b | 88c8 | 0014 | 2ecc | 3788 | 4a7c | 000c | 723c | 000d | cce4 | 000a | e3c0 | 27f0 | 0020 | 000d | 83c8 | 2520 | 4740 | 33bc | 247c | 000d | a664 | 0014 | 2ecc |
| 1360040 | 3d00 | 4a7c | 000c | 723c | 000a | 6d61 | 6b65 | 5f6b | 6579 | 5f31 | 0000 | 0000 | 2954 | 0020 | 0002 | 438a | 56f8 | 671c | 682c | 46ec | 37f0 | 247c | 000b | 88c8 |
| 1360120 | 0014 | 2330 | 000d | a6d4 | 27f0 | 0020 | 000d | 7c30 | 56f8 | 671c | 682c | 3050 | 37dc | 247c | 000b | 88f8 | 0010 | 2340 | 000d | a4d4 | 2cac | 0abf | 0002 | 438a |
| 1360200 | 2ca0 | c945 | 0000 | 0000 | 0000 | 0001 | 000d | c8e8 | 000d | 7c30 | 000d | c8f2 | 000d | 7c44 | 27f0 | 0012 | 000d | c940 | 5758 | 6b48 | 671c | 4950 | 228c | c8f4 |
| 1360260 | 28c4 | 001a | 000d | c95c | 5758 | 6750 | 55f0 | 6b48 | 671c | 57b8 | 6bb4 | 6b74 | 228c | 0abf | 28c4 | 0022 | 000d | 2b20 | 5758 | 67b8 | 55f0 | 6750 | 55f0 | 6b48 |
| 1360340 | 671c | 57b8 | 6c34 | 55f0 | 6bb4 | 6b74 | 228c | 2a87 | 0000 | 4a67 | b328 | 3555 | 000d | d980 | 0000 | 0000 | 27f0 | 0014 | 000d | c9a4 | 5758 | 6b48 | 671c | 3050 |

```
1360420 48c0 7220 28c4 001c 000d c9c0 5758 6750 55f0 6b48 671c 3050 57b8 6bb4 6b74 7220 28c4 0024 000d 2b88 5758 67b8 55f0 6750
1360500 55f0 6b48 671c 3050 57b8 6c34 55f0 6bb4 6b74 7220 0000 4987 b328 0abf 000e 197c 0000 0000 27f0 0020 000d ca3c 56f8 6110
1360560 0018 48f8 3588 3664 3614 0018 239c 0000 000d a644 2cac 3529 0002 438a 2ca0 0abf 0000 0000 0000 0000 000d c9f4 000d ca3c
1360640 000d 83b0 000d ca38 0000 0000 2954 001c 0002 438a 56f8 6580 0018 5818 6c84 0018 67b8 22bc 000d a5f4 0000 4987 b328 ca14
1360720 000d 8894 0000 0000 2c78 0028 0002 438a 2520 46ec 35c8 3280 24d0 0000 000b 8888 0014 37f0 40cc 0000 000b 88c8 000c 2eb0
1361000 0000 4a47 b328 3387 000d d9ec 0000 0000 27f0 0012 000d c8c8 4e1c 0000 0000 0007 228c cb15 2cac cab9 0002 438a 2ca0 cac5
1361060 0000 0000 0000 0001 000d caa0 000d c8c8 000d c9d2 000d cad8 000d caac 000b 7365 746f 665f 7374 6163 6b00 0000 2c78 001c
1361140 0002 438a 45c4 46d8 37dc 39f8 000d a6d4 0014 2330 000d a6d4 0300 498f b328 cbf1 000d 8a60 0000 0000 27f0 0014 000d cb54
1361220 4e1c 0000 0000 0007 54a8 228c 2cac 2a87 0002 438a 2ca0 34d9 0000 0000 0000 0001 000d cb18 000d cb78 000d 83a4 000d cb50
1361300 000d cb24 28c4 0024 000d cb78 56f8 671c 682c 46ec 37dc 247c 000b 88c8 0014 2ecc 2410 0000 000d a5cc 2954 0018 0002 438a
1361360 56f8 62c0 5758 6bf4 6750 22bc 000d a5cc 0200 498f b328 01b7 000d 8a2c 0000 0000 2c78 001c 0002 438a 5758 6b4d 6784 4550
1361440 6b48 6bf4 239c 0000 000d cbcc 000c 19a4 0200 4957 0000 4747 0000 0008 000d cc14 000d cc14 0001 0054 0000 0000 0000 49c7
1361520 b328 3387 000d 89f8 0000 0000 000d cb08 000d c1b4 000f 4c88 0000 0000 27f0 0018 000d cc3c 4e1c 0000 0000 0007 5758 5370
1361600 5370 228c 2cac 1fef 0002 438a 2ca0 0abf 0000 0000 0300 0001 000d cbfc 000d cc3c 000d cc46 000d cc38 000d cc08 2954 0028
1361660 0002 438a 56f8 6840 671c 4700 3310 247c 000d cbcc 0018 38d4 3d54 37f0 3cf4 234c 000d cc74 000d cbbc 0400 4957 0000 4747
1361740 0000 0010 000d cc98 000d cc98 0001 0054 0000 0000 27f0 0014 000d ccc0 4e1c 0000 0000 0007 49c8 228c 2cac 1fef 0002 438a
1362020 2ca0 0abf 0000 0000 0000 0001 000d cc84 000d ccc0 000d ccca 000d ccbc 000d cc90 2954 0024 0002 438a 56f8 6580 0018 5818
1362100 6670 001c 5878 001c 6b88 6c84 0018 22bc 000d cc74 0000 49bf b328 3387 000d 89c4 0000 0000 27f0 0014 000d 2df0 4e1c 0000
1362160 0000 0007 54f8 228c 2cac 3357 0002 438a 2ca0 0df7 0000 0000 0000 0001 000d ccf4 000d cd30 000d 838c 000d cd2c 000d cd00
1362240 2954 0014 0002 438a 56f8 5fa0 671c 22bc 000d a5ac 2c78 0018 0002 438a 56f8 60cc 3640 3600 239c 0000 000d cd6c 000c 19d4
1362320 0300 495f 0000 4747 0000 000c 000d cd18 000d cd18 0001 0054 0000 0000 2cac 0abf 0002 438a 2ca0 cd95 0000 0000 0000 0000
1362400 000d cd44 000d cd44 000d cd4e 000d cd30 0000 0000 0000 4997 b464 0abf 000d 8928 000d d7f8 000d cb90 000d cdbc 000a e4b8
1362460 0000 0000 27f0 0014 000d 2e90 4e1c 0000 0000 0007 54f8 228c 2cac 3357 0002 438a 2ca0 0abf 0000 0000 0000 0001 000d cdc4
1362540 000d ce20 000d 732c 000d cdfc 000d cd40 000c 1a04 0200 4967 0000 4747 0000 0008 000d ce58 000d ce58 0001 0054 0000 0000
1362620 2954 0014 0002 438a 56f8 5fa0 671c 22bc 000d cd6c 0000 498f b464 0abf 000d 88c0 000d d804 27f0 0012 000d ce80 4e1c 0000
1362700 0000 0007 228c 030b 2cac 0abf 0002 438a 2ca0 ce71 0000 0000 0000 0001 000d ce44 000d ce80 000d ce8a 000d ce7c 000d ce50
1362760 2954 0020 0002 438a 56f8 671c 682c 46ec 35c8 39f8 000b 88c8 0014 2330 000d ce10 2c78 0010 0002 438a 239c 0000 000d a5ac
1363040 0000 49b7 b328 0000 000d 8828 0000 0000 27f0 0014 000d cefc 4e1c 0000 0000 0007 54f8 228c 2cac 1fef 0002 438a 2ca0 0abf
1363120 0000 0000 0000 0001 000d cec0 000d cf24 000d 8350 000d cef8 000d cecc 28c4 0028 000d cf24 56f8 671c 682c 46ec 4768 37f0
1363200 24d0 0000 000b 88c8 0018 2ecc 23fc 0000 000d a6fc 2954 0014 0002 438a 56f8 76b0 239c 0000 000d a6fc 0000 4a6f b328 cf4d
1363260 000d da18 0000 0000 2c78 0024 0002 438a 45c4 46d8 3468 37dc 3ba0 0000 000d cf7c 0018 4390 3d6c 2330 000d cf7c 000d a71c
1363340 0400 4937 0000 4747 0000 0010 000d cf30 000d cfa0 0001 0054 0000 0000 27f0 0014 000d cfc8 4e1c 0000 0000 0007 49c8 228c
1363420 2cac 3357 0002 438a 2ca0 3387 0000 0000 0000 0001 000d cf8c 000d 3020 000d 8338 000d cfc4 000d cf98 28c4 0028 000d 3020
1363500 56f8 671c 682c 46ec 4768 47e4 37f0 247c 000b 88c8 001c 2ecc 23e4 0000 000d cf7c 0000 2287 b328 d290 000d 8560 0000 0000
1363560 27f0 0014 000d d03c 4e1c 0000 0000 0007 54f8 228c 2cac 3357 0002 438a 2ca0 0abf 0000 0000 0000 0001 000d d000 000d d03c
1363640 000d d046 000d d038 000d d00c 2954 0028 0002 438a 56f8 671c 682c 46ec 3468 35c8 3ba0 0000 000d d074 0018 3d6c 2410 0000
1363720 000d a6ac 000d a69c 0400 491f 0000 4747 0000 0010 000d d098 000d d098 0001 0054 0000 0000 27f0 0014 000d d0c0 4e1c 0000
1364000 0000 0007 49c8 228c 2cac 3357 0002 438a 2ca0 0abf 0000 0000 0000 0001 000d d084 000d d0c0 000d d0ca 000d d0bc 000d d090
1364060 2954 0028 0002 438a 56f8 6580 0018 57b8 6620 001c 5c9c 001c 0200 0ad7 6b88 6c84 0018 22bc 000d d074 0000 49b7 b328 0abf
1364140 000a 202c 0000 0000 27f0 0014 000d d134 4e1c 0000 0000 0007 4960 228c 2cac d111 0002 438a 2ca0 0153 0000 0000 0000 0001
1364220 000d d0f8 000d d134 000d d13e 000d d130 000d d104 2954 0028 0002 438a 56f8 671c 682c 46ec 57b8 6b74 6a50 37f0 24d0 0000
1364300 000b 88f8 0018 231c 000d a514 0400 2287 b328 3387 000d 95c0 0000 0000 27f0 0014 000d d1a8 4e1c 0000 0000 0007 4960 228c
1364360 2cac 3357 0002 438a 2ca0 0df7 0000 0000 0000 0001 000d d16c 000d d1d0 000d 8314 000d d1a4 000d d178 28c4 0028 000d d1d0
1364440 56f8 671c 682c 46ec 4768 37f0 24d0 0000 000b 88c8 0018 2ecc 23fc 0000 000d a78c 2954 0014 0002 438a 56f8 76b0 239c 0000
1364520 000d a78c 27f0 0016 000d d224 4e1c 0000 0000 0007 4960 5548 228c 3357 2cac d20d 0002 438a 2ca0 3357 0000 0000 0000 0001
1364600 000d d1e4 000d d24c 000d 82f0 000d d220 000d d1f0 28c4 0028 000d d24c 56f8 671c 682c 46ec 4768 47e4 37f0 247c 000b 88c8
1364660 001c 2ecc 23e4 0000 000d a7ac 2954 0024 0002 438a 56f8 6580 0018 57b9 6c84 0018 6784 5818 6c84 0018 67b8 22bc 000d a7ac
1364740 000c 1a34 0200 496f 0000 4747 0000 0008 000d d2b4 000d d2b4 0001 0054 0000 0000 0000 47a7 b328 3387 000a f3d4 0000 0000
1365020 27f0 0012 000d d2dc 4e1c 0000 0000 0007 228c 0abf 2cac 3357 0002 438a 2ca0 0df7 0000 0000 0000 0001 000d d2a0 000d d2dc
1365100 000d d2e6 000d d2d8 000d d2ac 2954 0020 0002 438a 56f8 671c 682c 46ec 37f0 247c 000d d30c 0014 2330 000d d280 000c 1abc
1365160 0200 4977 0000 4747 0000 0008 000d d340 000d d340 0001 0054 0000 0000 0000 47a7 b328 1fef 000d 8488 0000 0000 27f0 0012
1365240 000d d368 4e1c 0000 0000 0007 228c 3357 2cac 0df7 0002 438a 2ca0 d34d 0000 0000 0000 0001 000d d32c 000d d368 000d d372
1365320 000d d364 000d d338 2954 0020 0002 438a 56f8 671c 682c 46ec 37f0 247c 000b 88c8 0014 2330 000d d30c 000e 6c69 7374 5f69
1365400 6e73 7461 6e63 6573 0000 0000 000e 636f 6e6a 5f69 6e73 7461 6e63 6573 000d d388 000e 19fc 000d a484 0300 48c7 0000 3287
1365460 0000 000c 000d d3d4 000d d3d4 0041 0000 0000 0000 2c78 0010 0002 438a 239c 0000 000d a494 000d a4a4 0300 48cf 0000 3287
```

```
1365540 0000 000c 000d d404 000d d404 0041 0000 0000 0000 2c78 0010 0002 438a 239c 0000 000d a4b4 000d a4c4 0100 48d7 0000 3287
1365620 0000 0004 000d d434 000d d434 0041 0000 0000 0000 2c78 0010 0002 438a 239c 0000 000d a4d4 000d a4e4 0200 48df 0000 3287
1365700 0000 0008 000d d464 000d d464 0041 0000 0000 0000 2c78 0010 0002 438a 239c 0000 000d a4f4 000d a504 0300 48e7 0000 3287
1365760 0000 000c 000d d494 000d d494 0041 0000 0000 0000 2c78 0010 0002 438a 239c 0000 000d a514 000d a554 0200 48ef 0000 3287
1366040 0000 0008 000d d4c4 000d d4c4 0041 0000 0000 0000 2c78 0010 0002 438a 239c 0000 000d a53c 000d d4a4 0300 48ef 0000 3287
1366120 0000 000c 000d d4f4 000d d4f4 0041 0000 0000 0000 2c78 0010 0002 438a 239c 0000 000d a564 000d a59c 0200 48f7 0000 3287
1366200 0000 0008 000d d524 000d d524 0041 0000 0000 0000 2c78 0010 0002 438a 239c 0000 000d a584 000d d504 0300 48f7 0000 3287
1366260 0000 000c 000d d554 000d d554 0041 0000 0000 0000 2c78 0010 0002 438a 239c 0000 000d a5ac 000d a5bc 0200 48ff 0000 3287
1366340 0000 0008 000d d584 000d d584 0041 0000 0000 0000 2c78 0010 0002 438a 239c 0000 000d a5cc 000d a5e4 0400 4907 0000 3287
1366420 0000 0010 000d d5b4 000d d5b4 0041 0000 0000 0000 2c78 0010 0002 438a 239c 0000 000d a5f4 000d a60c 0200 490f 0000 3287
1366500 0000 0008 000d d5e4 000d d5e4 0041 0000 0000 0000 2c78 0010 0002 438a 239c 0000 000d a61c 000d a634 0300 4837 0000 3287
1366560 0000 000c 000d d614 000d d614 0041 0000 0000 0000 2c78 0010 0002 438a 239c 0000 000d a644 000d a654 0300 483f 0000 3287
1366640 0000 000c 000d d644 000d d644 0041 0000 0000 0000 2c78 0010 0002 438a 239c 0000 000d a664 000d a674 0200 4917 0000 3287
1366720 0000 0008 000d d574 000d d674 0041 0000 0000 0000 2c78 0010 0002 438a 239c 0000 000d a684 000d d064 0300 491f 0000 3287
1367000 0000 000c 000d d6a4 000d d6a4 0041 0000 0000 0000 2c78 0010 0002 438a 239c 0000 000d a6ac 000d a6c4 0200 4927 0000 3287
1367060 0000 0008 000d d6d4 000d d6d4 0041 0000 0000 0000 2c78 0010 0002 438a 239c 0000 000d a6d4 000d a6ec 0300 492f 0000 3287
1367140 0000 000c 000d d704 000d d704 0041 0000 0000 0000 2c78 0010 0002 438a 239c 0000 000d a6fc 000d cf6c 0300 4937 0000 3287
1367220 0000 000c 000d d734 000d d734 0041 0000 0000 0000 2c78 0010 0002 438a 239c 0000 000d a72c 000d a79c 0200 493f 0000 3287
1367300 0000 0008 000d d764 000d d764 0041 0000 0000 0000 2c78 0010 0002 438a 239c 0000 000d a75c 000d d744 0300 493f 0000 3287
1367360 0000 000c 000d d794 000d d794 0041 0000 0000 0000 2c78 0010 0002 438a 239c 0000 000d a78c 000d d774 0400 493f 0000 3287
1367440 0000 0010 000d d7c4 000d d7c4 0041 0000 0000 0000 2c78 0010 0002 438a 239c 0000 000d a7ac 0007 6374 725f 7365 7400 0000
1367520 0007 6374 725f 6465 6300 8398 b464 8330 000d 8990 0000 0000 b464 d7f0 000d 895c 000d d7ec b464 d7fc 000d 88f4 0000 0000
1367600 0008 6d61 6b65 5f6b 6579 001c b464 70e4 000d 858c 0000 0000 b464 0000 000e 55f4 0000 0000 0007 7365 7473 2e70 6c00 d840
1367660 000d dcb4 0000 002c b288 b66c 0000 0452 7fff ffff 000e 20ec 0200 0db5 0100 15ad 0100 13fd 0000 000b 0000 315f 002b 2f68
1367740 6f6d 652f 6f73 6173 322f 622f 7175 696e 7475 732f 7077 312e 312f 6c69 6272 6172 792f 666c 6174 7465 6e00 696e 002e 2f68
1370020 6f6d 652f 6f73 6173 322f 622f 7175 696e 7475 732f 7077 312e 312f 6c69 6272 6172 792f 666c 6174 7465 6e2e 706c 006f 6e73
1370100 0036 2f68 6f6d 652f 6f73 6173 322f 622f 7175 696e 7475 732f 6765 6e65 7269 632f 7170 6c69 6232 2e35 2f6c 6962 7261 7279
1370160 2f66 6c61 7474 656e 003b 2061 0039 2f68 6f6d 652f 6f73 6173 322f 622f 7175 696e 7475 732f 6765 6e65 7269 632f 7170 6c69
1370240 6232 2e35 2f6c 6962 7261 7279 2f66 6c61 7474 656e 2e70 6c00 0000 002c 000e 21b8 b27c b66c 0000 0455 7fff ffff 000a 2028
1370320 0200 0db5 0200 2f35 0000 4a67 0000 02bb 0000 315f 0000 002c 000a e5b4 b27c b66c 0000 047b 7fff ffff 000a f3d0 0200 0db5
1370400 0200 224d 0000 4a67 0000 4a47 0000 315f 2c78 0012 0002 438a 4e1c 0000 0000 4b2f 228c 0000 0000 002c 000b 0868 b27c b66c
1370460 0000 047c 7fff ffff 000a e5e8 0200 0db5 0200 24bd 0000 3287 0000 4a47 0000 315f 0000 002c 000d 8890 b27c b66c 0000 0459
1370540 7fff ffff 000e 2250 0200 0db5 0200 284d 0000 4a47 0000 4a67 0000 315f 0000 0034 000d 89f4 b27c b66c 0000 045a 7fff ffff
1370620 000d da48 0200 0db5 0400 242d 0000 4a6f 0000 0013 0000 4a47 0000 21cf 0000 315f 0000 0034 000d da14 b27c b66c 0000 045b
1370700 7fff ffff 000d da7c 0200 0db5 0400 242d 0000 4a77 0000 0013 0000 4a47 0000 21cf 0000 315f 0000 0034 000d da48 b27c b66c
1370760 0000 045c 7fff ffff 000d dab0 0200 0db5 0400 242d 0000 4a7f 0000 0013 0000 4a47 0000 21cf 0000 315f 0000 0034 000d da7c
1371040 b27c b66c 0000 045d 7fff ffff 000d dae4 0200 0db5 0400 242d 0000 4a87 0000 0013 0000 4a47 0000 21cf 0000 315f 0000 0034
1371120 000d dab0 b27c b66c 0000 045e 7fff ffff 000d db18 0200 0db5 0400 242d 0000 4a8f 0000 0013 0000 4a47 0000 21cf 0000 315f
1371200 0000 0034 000d dae4 b27c b66c 0000 045f 7fff ffff 000d db4c 0200 0db5 0400 242d 0000 4a97 0000 0013 0000 4a47 0000 21cf
1371260 0000 315f 0000 0034 000d db18 b27c b66c 0000 0460 7fff ffff 000d db80 0200 0db5 0400 242d 0000 4a9f 0000 0013 0000 4a47
1371340 0000 21cf 0000 315f 0000 0034 000d db4c b27c b66c 0000 0461 7fff ffff 000d dbb4 0200 0db5 0400 242d 0000 4aa7 0000 0013
1371420 0000 4a47 0000 21cf 0000 315f 0000 0034 000d db80 b27c b66c 0000 0462 7fff ffff 000d dbe8 0200 0db5 0400 242d 0000 4a47
1371500 0000 0013 0000 4a47 0000 21cf 0000 315f 0000 0034 000d dbb4 b27c b66c 0000 0463 7fff ffff 000d dc1c 0200 0db5 0400 242d
1371560 0000 4aaf 0000 0023 0000 4a47 0000 21cf 0000 315f 0000 0034 000d dbe8 b27c b66c 0000 0464 7fff ffff 000d dc50 0200 0db5
1371640 0400 242d 0000 4aaf 0000 002b 0000 4a47 0000 21cf 0000 315f 0000 0034 000d dc1c b27c b66c 0000 0465 7fff ffff 000d dc84
1371720 0200 0db5 0400 242d 0000 4ab7 0000 001b 0000 4a47 0000 21cf 0000 315f 0000 0034 000d dc50 b27c b66c 0000 0466 7fff ffff
1372000 000e 227c 0200 0db5 0400 242d 0000 4ab7 0000 0023 0000 4a47 0000 21cf 0000 315f 000d e038 0000 030c b27c b66c 0000 0467
1372060 0000 047d 000d d41c 0200 0db5 0500 1cdd 0000 21ef 0000 000b 0000 4a47 0072 1d83 0000 02bb 0000 315f 000d dd18 0000 002c
1372140 b4f0 b4e4 0000 0466 7fff ffff 0008 b0dd 0000 0000 0000 0000 000d e238 0002 438a 000e 4b30 000d dd50 0000 0038 b27c b66c
1372220 0000 0469 0000 047e 000d dd54 0200 0db5 0500 1cdd 0000 4a6f 0000 0013 0000 4a47 0072 0823 0000 02bb 0000 315f 000d dd88
1372300 0000 0038 b27c b66c 0000 046a 0000 047f 000d dd8c 0200 0db5 0500 1cdd 0000 4a77 0000 0013 0000 4a47 0072 09a3 0000 02bb
1372360 0000 315f 000d ddc0 0000 0038 b27c b66c 0000 046b 0000 0480 000d ddc4 0200 0db5 0500 1cdd 0000 4a7f 0000 0013 0000 4a47
1372440 0072 0b63 0000 02bb 0000 315f 000d ddf8 0000 0038 b27c b66c 0000 046c 0000 0481 000d ddfc 0200 0db5 0500 1cdd 0000 4a87
1372520 0000 0013 0000 4a47 0072 0d63 0000 02bb 0000 315f 000d de30 0000 0038 b27c b66c 0000 046d 0000 0482 000d de34 0200 0db5
1372600 0500 1cdd 0000 4a8f 0000 0013 0000 4a47 0072 0ee3 0000 02bb 0000 315f 000d de68 0000 0038 b27c b66c 0000 046e 0000 0483
```

| | | | | | | | | | | | | | | | | | | | | | | | | |
|---|---|---|---|---|---|---|---|---|---|---|---|---|---|---|---|---|---|---|---|---|---|---|---|---|
| 1372660 | 000d | de6c | 0200 | 0db5 | 0500 | 1cdd | 0000 | 4a97 | 0000 | 0013 | 0000 | 4a47 | 0072 | 1063 | 0000 | 02bb | 0000 | 315f | 000d | dea0 | 0000 | 0038 | b27c | b66c |
| 1372740 | 0000 | 046f | 0000 | 0484 | 000d | dea4 | 0200 | 0db5 | 0500 | 1cdd | 0000 | 4a9f | 0000 | 0013 | 0000 | 4a47 | 0072 | 11e3 | 0000 | 02bb | 0000 | 315f | 000d | ded8 |
| 1373020 | 0000 | 0038 | b27c | b66c | 0000 | 0470 | 0000 | 0485 | 000d | df1c | 0200 | 0db5 | 0500 | 1cdd | 0000 | 4aa7 | 0000 | 0013 | 0000 | 4a47 | 0072 | 13e3 | 0000 | 02bb |
| 1373100 | 0000 | 315f | 000d | df18 | 0000 | 0040 | 000e | 458c | 000e | 45bc | 000e | 45f0 | 000e | 46b4 | 000e | 4700 | 000e | 47ec | 000e | 4849 | 0000 | 0000 | 0000 | 0000 |
| 1373160 | 0000 | 0000 | 0000 | 0000 | 0000 | 0000 | 0000 | 0000 | 0000 | 0000 | 000d | df50 | 0000 | 0038 | b27c | b66c | 0000 | 0471 | 0000 | 0486 | 000d | df54 | 0200 | 0db5 |
| 1373240 | 0500 | 1cdd | 0000 | 4a47 | 0000 | 0013 | 0000 | 4a47 | 0072 | 1563 | 0000 | 02bb | 0000 | 315f | 000d | df88 | 0000 | 0038 | b27c | b66c | 0000 | 0472 | 0000 | 0487 |
| 1373320 | 000d | df8c | 0200 | 0db5 | 0500 | 1cdd | 0000 | 4a47 | 0000 | 001b | 0000 | 4a47 | 0072 | 3183 | 0000 | 02bb | 0000 | 315f | 000d | e038 | 0000 | 0038 | b27c | b66c |
| 1373400 | 0000 | 0473 | 0000 | 0488 | 000d | e03c | 0200 | 0db5 | 0500 | 1cdd | 0000 | 4aaf | 0000 | 002b | 0000 | 4a47 | 0072 | 18e3 | 0000 | 02bb | 0000 | 315f | 28c4 | 0078 |
| 1373460 | 000e | 46d8 | 45e8 | 0028 | 46ec | 4768 | 47f8 | 0024 | 4880 | 0019 | 001c | 41fc | 0000 | 0013 | 37f0 | 37c4 | 0028 | 6f34 | 3410 | 0020 | 382c | 0028 | 4240 | 0000 |
| 1373540 | 0000 | 000b | 6e74 | 33a0 | 382c | 0028 | 4240 | 0000 | 0000 | 0013 | 6e74 | 2ecc | 3520 | 0018 | 38fc | 0024 | 386c | 37f0 | 40b4 | 0020 | 000e | 431c | 0020 | 3984 |
| 1373620 | 0018 | 001c | 3dad | 386c | 37f0 | 3cf4 | 242c | 0000 | 000e | 431c | 000d | e0dc | 0000 | 0038 | b27c | b66c | 0000 | 0474 | 0000 | 0489 | 000d | e0e0 | 0200 | 0db5 |
| 1373700 | 0500 | 1cdd | 0000 | 4aaf | 0000 | 0023 | 0000 | 4a47 | 0072 | 16e3 | 0000 | 02bb | 0000 | 315f | 27f0 | 006c | 000e | 46ec | 45e8 | 0024 | 46ec | 4790 | 0020 | 47e4 |
| 1373760 | 9350 | 0024 | 9410 | 41fc | 0000 | 0013 | 37f0 | 37c4 | 0024 | 6f34 | 3410 | 001c | 382c | 0024 | 4240 | 0000 | 0000 | 000b | 6e74 | 33a0 | 382c | 0024 | 4240 | 0000 |
| 1374040 | 0000 | 0013 | 6e74 | 2ecc | 3468 | 3894 | 0020 | 37f0 | 40b4 | 001c | 000e | 42dc | 001c | 38e8 | 3d6c | 37f0 | 3cf4 | 234c | 000e | 42dc | 000d | e144 | 0000 | 0038 |
| 1374120 | b27c | b66c | 0000 | 0475 | 0000 | 048a | 000d | e148 | 0200 | 0db5 | 0500 | 1cdd | 0000 | 4ab7 | 0000 | 0023 | 0000 | 4a47 | 0072 | 1b63 | 0000 | 02bb | 0000 | 315f |
| 1374200 | 28c4 | 0030 | 000e | 476c | 56f8 | 6854 | 69b0 | 46ec | 47e4 | 3858 | 4254 | 0000 | 0000 | 33e7 | 31f0 | 247c | 0008 | bb7c | 001c | 2ecc | 23e4 | 0000 | 000e | 475c |
| 1374260 | 000d | e1ac | 0000 | 0038 | b27c | b66c | 0000 | 0476 | 0000 | 048b | 000d | e1b0 | 0200 | 0db5 | 0500 | 1cdd | 0000 | 4ab7 | 0000 | 001b | 0000 | 4a47 | 0072 | 19e3 |
| 1374340 | 0000 | 02bb | 0000 | 315f | 27f0 | 0030 | 000e | 47d0 | 56f9 | 6854 | 69b0 | 46ec | 477c | 3858 | 4254 | 0000 | 0000 | 33e7 | 31f0 | 247c | 0008 | bb7c | 001c | 2ecc |
| 1374420 | 23e4 | 0000 | 000e | 475c | 000d | e234 | 0000 | 0038 | b27c | b66c | 0000 | 0477 | 0000 | 048c | 000d | e238 | 0200 | 0db5 | 0500 | 1cdd | 0000 | 4abf | 0000 | 0023 |
| 1374500 | 0000 | 4a47 | 0072 | 1ae3 | 0000 | 02bb | 0000 | 315f | 2954 | 0050 | 0002 | 438a | 56f8 | 687c | 001c | 69b0 | 46ec | 4790 | 0020 | 47e4 | 4268 | 0000 | 0000 | 0013 |
| 1374560 | 37f0 | 32b8 | 6f34 | 3394 | 0020 | 3804 | 4240 | 0000 | 0000 | 000b | 6e74 | 3894 | 001c | 3804 | 4240 | 0000 | 0000 | 0013 | 6e74 | 38e8 | 3d6c | 2330 | 000e | 475c |
| 1374640 | 000d | e2c0 | 0000 | 0038 | b130 | b66c | 0000 | 0478 | 0000 | 048d | 000d | dcf1 | 0200 | 0db5 | 0500 | 1cdd | 0000 | 4ac7 | 0000 | 0023 | 0000 | 4a47 | 0072 | 3cc3 |
| 1374720 | 0000 | 02bb | 0000 | 315f | 2954 | 0054 | 0002 | 438a | 56f8 | 6840 | 69b0 | 4728 | 0020 | 4768 | 47f8 | 001c | 4268 | 0000 | 0000 | 0013 | 3804 | 37c4 | 001c | 6f34 |
| 1375000 | 3894 | 0020 | 382c | 001c | 4240 | 0000 | 0000 | 000b | 6e74 | 33f4 | 382c | 001c | 4240 | 0000 | 0000 | 0013 | 6e74 | 3da8 | 23fc | 0000 | 000e | 4798 | 000d | f86c |
| 1375060 | 0000 | 158c | 0000 | 320f | 0000 | 3357 | 0200 | 0abf | 000d | e2d9 | 000d | e385 | 0200 | 0abf | 000d | e349 | 000d | e2e5 | 0300 | 08af | 0000 | 1ea7 | 000d | e2f5 |
| 1375140 | 000e | e20d | 0300 | 2ba7 | 0000 | 2e97 | 0000 | 000b | 0000 | 001f | 0400 | 242f | 0000 | 2e97 | 0000 | 000b | 000d | e300 | 0000 | 1e7f | 0200 | 0db7 | 000d | e305 |
| 1375220 | 0000 | 315f | 0200 | 0db7 | 000d | e331 | 0000 | 315f | 0400 | 242f | 0000 | 2e97 | 0000 | 000b | 0000 | 001f | 0000 | 1e7f | 0000 | 3357 | 0200 | 0abf | 000d | e365 |
| 1375300 | 0000 | 3357 | 0000 | 3357 | 0200 | 0b3f | 0000 | 2c47 | 0000 | 000b | 0200 | 0df7 | 000d | e359 | 000d | e371 | 0300 | 2a87 | 0000 | 03ef | 000d | 7ddc | 0000 | 3257 |
| 1375360 | 0000 | 3357 | 0200 | 0abf | 000d | e391 | 000d | e43d | 0200 | 0abf | 000d | e401 | 000d | e39d | 0300 | 08af | 0000 | 1ea7 | 000d | e3ad | 000e | e1f5 | 0300 | 2ba7 |
| 1375440 | 0000 | 1fa7 | 0000 | 000b | 0000 | 001f | 0400 | 242f | 0000 | 1fa7 | 0000 | 000b | 000d | e3b8 | 0000 | 1e7f | 0200 | 0db7 | 000d | e3bd | 0000 | 315f | 0200 | 0db7 |
| 1375520 | 000d | e3e9 | 0000 | 315f | 0400 | 242f | 0000 | 1fa7 | 0000 | 000b | 0000 | 001f | 0000 | 1e7f | 0000 | 3357 | 0200 | 0abf | 000d | e41d | 0000 | 3357 | 0000 | 3357 |
| 1375600 | 0200 | 0b3f | 0000 | 2c47 | 0000 | 000b | 0200 | 0df7 | 000d | e411 | 000d | e429 | 0300 | 2a87 | 0000 | 03ef | 000d | 7d78 | 0000 | 3257 | 0000 | 3357 | 0200 | 0abf |
| 1375660 | 000d | e449 | 000d | e559 | 0200 | 0abf | 0000 | 3357 | 000d | e455 | 0200 | 0abf | 0000 | 3357 | 000d | e461 | 0200 | 0abf | 000d | e4a5 | 000d | e46d | 0200 | 0abf |
| 1375740 | 000d | e545 | 000d | e479 | 0100 | 08af | 0000 | 033f | 0200 | 08cf | 000d | 7e94 | 0000 | 3c87 | 0200 | 0ad7 | 0000 | 001f | 0000 | 0007 | 0200 | 08cf | 000d | 7e94 |
| 1376020 | 0000 | 3c87 | 0200 | 0abf | 000d | e4d5 | 000d | e4b1 | 0300 | 08af | 0000 | 1ea7 | 000d | e4c1 | 000e | e1cd | 0300 | 2ba7 | 0000 | 08cf | 0000 | 0013 | 0000 | 001f |
| 1376100 | 0000 | 3357 | 0200 | 0abf | 000d | e4f1 | 000d | e509 | 0000 | 3357 | 0200 | 0b3f | 0000 | 2c47 | 0000 | 0013 | 0200 | 0df7 | 000d | e4e5 | 000d | e4fd | 0100 | 1fef |
| 1376160 | 0000 | 3c87 | 0000 | 3357 | 0200 | 0abf | 000d | e525 | 0000 | 3357 | 0000 | 3357 | 0200 | 0b3f | 0000 | 2c47 | 0000 | 000b | 0200 | 0df7 | 000d | e519 | 000d | e531 |
| 1376240 | 0300 | 2a87 | 0000 | 3357 | 000d | 7e94 | 0000 | 3257 | 0000 | 3357 | 0200 | 0df7 | 0000 | 26c7 | 000d | e551 | 0100 | 1fef | 0000 | 0003 | 0200 | 0abf | 000d | e565 |
| 1376320 | 000d | e945 | 0200 | 0abf | 0000 | 3357 | 000d | e571 | 0200 | 0abf | 0000 | 3357 | 000d | e57d | 0200 | 0abf | 000d | e5c1 | 000d | e589 | 0200 | 0abf | 000d | e931 |
| 1376400 | 000d | e595 | 0100 | 08af | 0000 | 033f | 0200 | 08cf | 000d | 7e94 | 000d | 85b1 | 0200 | 0ad7 | 0000 | 001f | 0000 | 0007 | 0200 | 08cf | 000d | 7e94 | 000d | 85b1 |
| 1376460 | 0200 | 0abf | 000d | e5f1 | 000d | e5cd | 0300 | 08af | 0000 | 1ea7 | 000d | e5dd | 000e | e169 | 0300 | 2ba7 | 0000 | 08cf | 0000 | 0013 | 0000 | 001f | 0000 | 3357 |
| 1376540 | 0200 | 0abf | 000d | e60d | 000d | e8f5 | 0000 | 3357 | 0200 | 0b3f | 0000 | 2c47 | 0000 | 0013 | 0200 | 0abf | 000d | e671 | 000d | e619 | 0200 | 0abf | 000d | e625 |
| 1376620 | 000d | e651 | 0200 | 0df7 | 000d | e631 | 000d | e63d | 0200 | 0b3f | 0000 | 2c47 | 0000 | 0013 | 0100 | 231f | 000d | e645 | 0200 | 0b3f | 0000 | 0abf | 0000 | 0013 |
| 1376700 | 0200 | 0abf | 000d | e665 | 000d | e65d | 0100 | 08af | 0000 | 01b7 | 0200 | 0abf | 000d | e8c5 | 000d | e67d | 0200 | 0abf | 000d | e8d1 | 000d | e699 | 0200 | 0df7 |
| 1376760 | 0000 | 3387 | 000d | e589 | 0300 | 2a87 | 0000 | 03ef | 000e | 4905 | 0000 | 23ff | 0200 | 0abf | 000d | e701 | 000d | e6a5 | 0200 | 0abf | 000d | e6b1 | 000d | e6e1 |
| 1377040 | 0200 | 0df7 | 000d | e6bd | 000d | e6d1 | 0100 | 3387 | 000d | e6c5 | 0200 | 0b3f | 0000 | 0abf | 0000 | 0013 | 0300 | 2a87 | 0000 | 228f | 000d | e690 | 0000 | 320f |
| 1377120 | 0200 | 0abf | 000d | e6f5 | 000d | e6ed | 0100 | 08af | 0000 | 01b7 | 0200 | 0abf | 000d | e899 | 000d | e70d | 0200 | 0abf | 000d | e8a5 | 000d | e729 | 0200 | 0df7 |
| 1377200 | 0000 | 3387 | 000d | e719 | 0300 | 2a87 | 0000 | 03ef | 000e | 48d9 | 0000 | 23ff | 0200 | 0abf | 000d | e791 | 000d | e735 | 0200 | 0abf | 000d | e741 | 000d | e771 |
| 1377260 | 0200 | 0df7 | 000d | e74d | 000d | e761 | 0100 | 3397 | 000d | e755 | 0200 | 0b3f | 0000 | 0abf | 0000 | 0013 | 0300 | 2a87 | 0000 | 228f | 000d | e720 | 0000 | 320f |
| 1377340 | 0200 | 0abf | 000d | e785 | 000d | e77d | 0100 | 08af | 0000 | 01b7 | 0200 | 0abf | 000d | e86d | 000d | e79d | 0200 | 0abf | 000d | e879 | 000d | e7b9 | 0200 | 0df7 |
| 1377420 | 0000 | 3387 | 000d | e7a9 | 0300 | 2a87 | 0000 | 03ef | 000e | 48b5 | 0000 | 23ff | 0200 | 0abf | 000d | e821 | 000d | e7c5 | 0200 | 0abf | 000d | e7d1 | 000d | e801 |
| 1377500 | 0200 | 0df7 | 000d | e7dd | 000d | e7f1 | 0100 | 3397 | 000d | e7e5 | 0200 | 0b3f | 0000 | 0abf | 0000 | 0013 | 0300 | 2a87 | 0000 | 228f | 000d | e7b0 | 0000 | 320f |
| 1377560 | 0200 | 0abf | 000d | e815 | 000d | e80d | 0100 | 08af | 0000 | 01b7 | 0200 | 0abf | 000d | e841 | 000d | e82d | 0200 | 0abf | 000d | e84d | 0000 | 3357 | 0200 | 0df7 |
| 1377640 | 0000 | 3387 | 000d | e839 | 0100 | 1fef | 0000 | 3c8f | 0200 | 0abf | 0000 | 3357 | 000d | e859 | 0200 | 0abf | 0000 | 3357 | 0000 | 3357 | 0200 | 0df7 | 0000 | 3387 |
| 1377720 | 000d | e865 | 0100 | 1fef | 0000 | 3c8f | 0200 | 0abf | 0000 | 3357 | 000d | e885 | 0200 | 0abf | 0000 | 3357 | 0000 | 3357 | 0200 | 0df7 | 0000 | 3387 | 000d | e891 |

| | | | | | | | | | | | | | | | | | | | | | | | | |
|---|---|---|---|---|---|---|---|---|---|---|---|---|---|---|---|---|---|---|---|---|---|---|---|---|
| 1400000 | 0100 | 1fef | 0000 | 3c8f | 0200 | 0abf | 0000 | 3357 | 000d | e8b1 | 0200 | 0abf | 0000 | 3357 | 0000 | 3357 | 0200 | 0df7 | 0000 | 3387 | 000d | e8bd | 0100 | 1fef |
| 1400060 | 0000 | 06df | 0200 | 0abf | 0000 | 3357 | 000d | e8dd | 0200 | 0abf | 0000 | 3357 | 0000 | 3357 | 0200 | 0df7 | 0000 | 3387 | 000d | e8e9 | 0100 | 1fef | 0000 | 06df |
| 1400140 | 0000 | 3357 | 0200 | 0abf | 000d | e911 | 0000 | 3357 | 0000 | 3357 | 0200 | 0b3f | 0000 | 2c47 | 0000 | 000b | 0200 | 0df7 | 000d | e905 | 000d | e91d | 0300 | 2a87 |
| 1400220 | 0000 | 3357 | 000d | 7e94 | 0000 | 3257 | 0000 | 3357 | 0200 | 0df7 | 0000 | 26c7 | 000d | e93d | 0100 | 1fef | 0000 | 0003 | 0200 | 0abf | 000d | e951 | 000d | ebb9 |
| 1400300 | 0200 | 0abf | 0000 | 3357 | 000d | e95d | 0200 | 0abf | 0000 | 3357 | 000d | e969 | 0200 | 0abf | 000d | e9ad | 000d | e975 | 0200 | 0abf | 000d | eba5 | 000d | e981 |
| 1400360 | 0100 | 08af | 0000 | 033f | 0200 | 08cf | 000d | 7e94 | 000d | 8641 | 0200 | 0ad7 | 0000 | 001f | 0000 | 0007 | 0200 | 08cf | 000d | 7e94 | 000d | 8641 | 0200 | 0abf |
| 1400440 | 000d | e9dd | 000d | e9b9 | 0300 | 08af | 0000 | 1ea7 | 000d | e9c9 | 000e | e135 | 0300 | 2ba7 | 0000 | 08cf | 0000 | 0013 | 0000 | 001f | 0000 | 3357 | 0200 | 0abf |
| 1400520 | 000d | e9f9 | 000d | eb69 | 0000 | 3357 | 0200 | 0b3f | 0000 | 2c47 | 0000 | 0013 | 0200 | 0abf | 000d | ea5d | 000d | ea05 | 0200 | 0abf | 000d | ea11 | 000d | ea3d |
| 1400600 | 0200 | 0df7 | 000d | ea1d | 000d | ea29 | 0200 | 0b3f | 0000 | 2c47 | 0000 | 0013 | 0100 | 231f | 000d | ea31 | 0200 | 0b3f | 0000 | 0abf | 0000 | 0013 | 0200 | 0abf |
| 1400660 | 000d | ea51 | 000d | ea49 | 0100 | 08af | 0000 | 01b7 | 0200 | 0abf | 000d | eb39 | 000d | ea69 | 0200 | 0abf | 000d | eb45 | 000d | ea85 | 0200 | 0df7 | 0000 | 3387 |
| 1400740 | 000d | ea75 | 0300 | 2a87 | 0000 | 03ef | 000e | 4941 | 0000 | 23ff | 0200 | 0abf | 000d | eaed | 000d | ea91 | 0200 | 0abf | 000d | ea9d | 000d | eacd | 0200 | 0df7 |
| 1401020 | 000d | eaa9 | 000d | eabd | 0100 | 3387 | 000d | eab1 | 0200 | 0b3f | 0000 | 0abf | 0000 | 0013 | 0300 | 2a87 | 0000 | 228f | 000d | ea7c | 0000 | 320f | 0200 | 0abf |
| 1401100 | 000d | eae1 | 000d | ead9 | 0100 | 08af | 0000 | 01b7 | 0200 | 0abf | 000d | eb0d | 000d | eaf9 | 0200 | 0abf | 000d | eb19 | 0000 | 3357 | 0200 | 0df7 | 0000 | 3387 |
| 1401160 | 000d | eb05 | 0100 | 1fef | 0000 | 3c8f | 0200 | 0abf | 0000 | 3357 | 000d | eb25 | 0200 | 0abf | 0000 | 3357 | 0000 | 3357 | 0200 | 0df7 | 0000 | 3387 | 000d | eb31 |
| 1401240 | 0100 | 1fef | 0000 | 3c8f | 0200 | 0abf | 0000 | 3357 | 000d | eb51 | 0200 | 0abf | 0000 | 3357 | 0000 | 3357 | 0200 | 0df7 | 0000 | 3387 | 000d | eb5d | 0100 | 1fef |
| 1401320 | 0000 | 3c8f | 0000 | 3357 | 0200 | 0abf | 000d | eb85 | 0000 | 3357 | 0000 | 3357 | 0200 | 0b3f | 0000 | 2c47 | 0000 | 000b | 0200 | 0df7 | 000d | eb79 | 000d | eb91 |
| 1401400 | 0300 | 2a87 | 0000 | 3357 | 000d | 7e94 | 0000 | 3257 | 0000 | 3357 | 0200 | 0df7 | 0000 | 26c7 | 000d | ebb1 | 0100 | 1fef | 0000 | 0003 | 0200 | 0abf | 000d | ebc5 |
| 1401460 | 000d | eee9 | 0200 | 0abf | 0000 | 3357 | 000d | ebd1 | 0200 | 0abf | 0000 | 3357 | 000d | ebdd | 0200 | 0abf | 000d | ec21 | 000d | ebe9 | 0200 | 0abf | 000d | eed5 |
| 1401540 | 000d | ebf5 | 0100 | 08af | 0000 | 033f | 0200 | 08cf | 000d | 7e94 | 000d | 86e5 | 0200 | 0ad7 | 0000 | 001f | 0000 | 0007 | 0200 | 08cf | 000d | 7e94 | 000d | 86e5 |
| 1401620 | 0200 | 0abf | 000d | ec51 | 000d | ec2d | 0300 | 08af | 0000 | 1ea7 | 000d | ec3d | 000e | e0dd | 0300 | 2ba7 | 0000 | 08cf | 0000 | 0013 | 0000 | 001f | 0000 | 3357 |
| 1401700 | 0200 | 0abf | 000d | ec6d | 000d | ee99 | 0000 | 3357 | 0200 | 0b3f | 0000 | 2c47 | 0000 | 0013 | 0200 | 0abf | 000d | ecd1 | 000d | ec79 | 0200 | 0abf | 000d | ec85 |
| 1401760 | 000d | ecb1 | 0200 | 0df7 | 000d | ec91 | 000d | ec9d | 0200 | 0b3f | 0000 | 2c47 | 0000 | 0013 | 0100 | 231f | 000d | eca5 | 0200 | 0b3f | 0000 | 0abf | 0000 | 0013 |
| 1402040 | 0200 | 0abf | 000d | ecc5 | 000d | ecbd | 0100 | 08af | 0000 | 01b7 | 0200 | 0abf | 000d | ee69 | 000d | ecdd | 0200 | 0abf | 000d | ee75 | 000d | ecf9 | 0200 | 0df7 |
| 1402120 | 0000 | 3387 | 000d | ece9 | 0300 | 2a87 | 0000 | 03ef | 000e | 4999 | 0000 | 23ff | 0200 | 0abf | 000d | ed61 | 000d | ed05 | 0200 | 0abf | 000d | ed11 | 000d | ed41 |
| 1402200 | 0200 | 0df7 | 000d | ed1d | 000d | ed31 | 0100 | 3387 | 000d | ed25 | 0200 | 0b3f | 0000 | 0abf | 0000 | 0013 | 0300 | 2a87 | 0000 | 228f | 000d | ecf0 | 0000 | 320f |
| 1402260 | 0200 | 0abf | 000d | ed55 | 000d | ed4d | 0100 | 08af | 0000 | 01b7 | 0200 | 0abf | 000d | ee3d | 000d | ed6d | 0200 | 0abf | 000d | ee49 | 000d | ed89 | 0200 | 0df7 |
| 1402340 | 0000 | 3387 | 000d | ed79 | 0300 | 2a87 | 0000 | 03ef | 000e | 4975 | 0000 | 23ff | 0200 | 0abf | 000d | edf1 | 000d | ed95 | 0200 | 0abf | 000d | eda1 | 000d | edd1 |
| 1402420 | 0200 | 0df7 | 000d | edad | 000d | edc1 | 0100 | 3387 | 000d | edb5 | 0200 | 0b3f | 0000 | 0abf | 0000 | 0013 | 0300 | 2a87 | 0000 | 228f | 000d | ed80 | 0000 | 320f |
| 1402500 | 0200 | 0abf | 000d | ede5 | 000d | eddd | 0100 | 08af | 0000 | 01b7 | 0200 | 0abf | 000d | ee11 | 000d | edfd | 0200 | 0abf | 000d | ee1d | 0000 | 3357 | 0200 | 0df7 |
| 1402560 | 0000 | 3387 | 000d | ee09 | 0100 | 1fef | 0000 | 3c8f | 0200 | 0abf | 0000 | 3357 | 000d | ee29 | 0200 | 0abf | 0000 | 3357 | 0000 | 3357 | 0200 | 0df7 | 0000 | 3387 |
| 1402640 | 000d | ee35 | 0100 | 1fef | 0000 | 3c8f | 0200 | 0abf | 0000 | 3357 | 000d | ee55 | 0200 | 0abf | 0000 | 3357 | 0000 | 3357 | 0200 | 0df7 | 0000 | 3387 | 000d | ee61 |
| 1402720 | 0100 | 1fef | 0000 | 3c8f | 0200 | 0abf | 0000 | 3357 | 000d | ee81 | 0200 | 0abf | 0000 | 3357 | 0000 | 3357 | 0200 | 0df7 | 0000 | 3387 | 000d | ee8d | 0100 | 1fef |
| 1403000 | 0000 | 3c97 | 0000 | 3357 | 0200 | 0abf | 000d | eeb5 | 0000 | 3357 | 0000 | 3357 | 0200 | 0b3f | 0000 | 2c47 | 0000 | 000b | 0200 | 0df7 | 000d | eea9 | 000d | eec1 |
| 1403060 | 0300 | 2a87 | 0000 | 3357 | 000d | 7e94 | 0000 | 3257 | 0000 | 3357 | 0200 | 0df7 | 0000 | 26c7 | 000d | eee1 | 0100 | 1fef | 0000 | 0003 | 0200 | 0abf | 000d | eef5 |
| 1403140 | 000d | ef05 | 0100 | 08af | 000d | eefd | 0100 | 207f | 0000 | 005b | 0200 | 0abf | 000d | ef29 | 000d | ef11 | 0200 | 0abf | 000d | ef6d | 000d | ef51 | 0200 | 0b3f |
| 1403220 | 0000 | 2c47 | 0000 | 000b | 0200 | 0df7 | 000d | ef1d | 000d | ef35 | 0300 | 2a87 | 0000 | 03ef | 000d | 7e94 | 0000 | 3257 | 0200 | 0b3f | 0000 | 23a7 | 000d | ef24 |
| 1403300 | 0200 | 0df7 | 000d | ef45 | 000d | ef5d | 0300 | 2a87 | 0000 | 03ef | 000d | 78a0 | 0000 | 2717 | 0100 | 08af | 0000 | 0367 | 0000 | 0003 | 000e | 3459 | 0200 | 17a7 |
| 1403360 | 0000 | 0003 | 0000 | 0003 | 000d | ef91 | 000d | efaa | 0200 | 0ad7 | 000d | ef7d | 000d | 89bd | 0200 | 17a7 | 0000 | 0003 | 0000 | 000b | 000d | efb1 | 000d | efda |
| 1403440 | 0200 | 0ad7 | 000d | ef9d | 000d | 8af9 | 0200 | 0ad7 | 000d | ef9d | 000d | 8b05 | 0200 | 17a7 | 0000 | 0003 | 0000 | 0013 | 0000 | 0003 | 000d | efe1 | 000d | f00a |
| 1403520 | 0200 | 0ad7 | 000d | efc9 | 000d | 9abd | 0200 | 0ad7 | 000d | efc9 | 000d | 8ac9 | 0200 | 17a7 | 0000 | 0003 | 0000 | 001b | 0000 | 0003 | 000d | f011 | 000d | f02a |
| 1403600 | 0200 | 0ad7 | 000d | eff9 | 000d | 89dd | 0200 | 17a7 | 0000 | 0003 | 0000 | 0023 | 000d | f031 | 000d | f04e | 0200 | 0ad7 | 000d | f01d | 000d | 8c05 | 0200 | 17a7 |
| 1403660 | 0000 | 0003 | 0000 | 002b | 0000 | 0003 | 000d | f055 | 000d | f072 | 0200 | 0ad7 | 000d | f03d | 000d | cb55 | 0200 | 17a7 | 0000 | 0003 | 0000 | 0033 | 0000 | 0013 |
| 1403740 | 000d | f079 | 000d | f092 | 0200 | 0ad7 | 000d | f061 | 000d | cbdd | 0200 | 17a7 | 0000 | 0003 | 0000 | 003b | 000d | f099 | 000d | f0b2 | 0200 | 0ad7 | 000d | f085 |
| 1404020 | 000d | cbb1 | 0200 | 17a7 | 0000 | 0003 | 0000 | 0043 | 000d | f0b9 | 000d | f0d2 | 0200 | 0ad7 | 000d | f0a5 | 000d | cb91 | 0200 | 17a7 | 0000 | 0003 | 0000 | 004b |
| 1404100 | 000d | f0d9 | 000d | f0f6 | 0200 | 0ad7 | 000d | f0c5 | 000d | cac5 | 0200 | 17a7 | 0000 | 0003 | 0000 | 0053 | 0000 | 0013 | 000d | f0fd | 000d | f116 | 0200 | 0ad7 |
| 1404160 | 000d | f0e5 | 000d | cc09 | 0200 | 17a7 | 0000 | 0003 | 0000 | 005b | 000d | f11d | 000d | f136 | 0200 | 0ad7 | 000d | f109 | 000d | cb21 | 0200 | 17a7 | 0000 | 0003 |
| 1404240 | 0000 | 0063 | 000d | f13d | 000d | f156 | 0200 | 0ad7 | 000d | f129 | 000d | cb01 | 0200 | 17a7 | 0000 | 0003 | 0000 | 006b | 000d | f15d | 000d | f17a | 0200 | 0ad7 |
| 1404320 | 000d | f149 | 000d | ca35 | 0200 | 17a7 | 0000 | 0003 | 0000 | 0073 | 0000 | 0013 | 000d | f181 | 000d | f19a | 0200 | 0ad7 | 000d | f169 | 000d | cc35 | 0200 | 17a7 |
| 1404400 | 0000 | 0003 | 0000 | 007b | 000d | f1a1 | 000d | f1ba | 0200 | 0ad7 | 000d | f18d | 000d | ca91 | 0200 | 17a7 | 0000 | 0003 | 0000 | 0083 | 000d | f1c1 | 000d | f1da |
| 1404460 | 0200 | 0ad7 | 000d | f1ad | 000d | ca71 | 0200 | 17a7 | 0000 | 0003 | 0000 | 008b | 000d | f1e1 | 000d | f1fe | 0200 | 0ad7 | 000d | f1cd | 000d | c9a5 | 0200 | 17a7 |
| 1404540 | 0000 | 0003 | 0000 | 0093 | 0000 | 0013 | 000d | f205 | 000d | f21e | 0200 | 0ad7 | 000d | f1ed | 000d | cc61 | 0200 | 17a7 | 0000 | 0003 | 0000 | 009b | 000d | f225 |
| 1404620 | 000d | f23e | 0200 | 0ad7 | 000d | f211 | 000d | ca01 | 0200 | 17a7 | 0000 | 0003 | 0000 | 00a3 | 000d | f245 | 000d | f25e | 0200 | 0ad7 | 000d | f231 | 000d | c9e1 |
| 1404700 | 0200 | 17a7 | 0000 | 0003 | 0000 | 00ab | 000d | f265 | 000d | f282 | 0200 | 0ad7 | 000d | f251 | 000d | c915 | 0200 | 17a7 | 0000 | 0003 | 0000 | 00b3 | 0000 | 0013 |
| 1404760 | 000d | f289 | 000d | f2a2 | 0200 | 0ad7 | 000d | f271 | 000d | cc8d | 0200 | 17a7 | 0000 | 0003 | 0000 | 00bb | 000d | f2a9 | 000d | f2c2 | 0200 | 0ad7 | 000d | f295 |
| 1405040 | 000d | c971 | 0200 | 17a7 | 0000 | 0003 | 0000 | 00c3 | 000d | f2c9 | 000d | f2e2 | 0200 | 0ad7 | 000d | f2b5 | 000d | c951 | 0200 | 17a7 | 0000 | 0003 | 0000 | 00cb |

| | | | | | | | | | | | | | | | | | | | | | | | | |
|---|---|---|---|---|---|---|---|---|---|---|---|---|---|---|---|---|---|---|---|---|---|---|---|---|
| 1405120 | 000d | f2e9 | 000d | f306 | 0200 | 0ad7 | 000d | f2d5 | 000d | c885 | 0200 | 17a7 | 0000 | 0003 | 0000 | 00d3 | 0000 | 0013 | 000d | f30d | 000d | f326 | 0200 | 0ad7 |
| 1405200 | 000d | f2f5 | 000d | ccb9 | 0200 | 17a7 | 0000 | 0003 | 0000 | 00db | 000d | f32d | 000d | f346 | 0200 | 0ad7 | 000d | f319 | 000d | c8e1 | 0200 | 17a7 | 0000 | 0003 |
| 1405260 | 0000 | 00e3 | 000d | f34d | 000d | f366 | 0200 | 0ad7 | 000d | f339 | 000d | c8c1 | 0200 | 17a7 | 0000 | 0003 | 0000 | 00eb | 000d | f36d | 000d | f38a | 0200 | 0ad7 |
| 1405340 | 000d | f359 | 000d | c7f5 | 0200 | 17a7 | 0000 | 0003 | 0000 | 00f3 | 0000 | 0013 | 000d | f391 | 000d | f3aa | 0200 | 0ad7 | 000d | f379 | 000d | cce5 | 0200 | 17a7 |
| 1405420 | 0000 | 0003 | 0000 | 00fb | 000d | f3b1 | 000d | f3ca | 0200 | 0ad7 | 000d | f39d | 000d | c851 | 0200 | 17a7 | 0000 | 0003 | 0000 | 0103 | 000d | f3d1 | 000d | f3ea |
| 1405500 | 0200 | 0ad7 | 000d | f3bd | 000d | c831 | 0200 | 17a7 | 0000 | 0003 | 0000 | 010b | 000d | f3f1 | 000d | f40e | 0200 | 0ad7 | 000d | f3dd | 000d | c765 | 0200 | 17a7 |
| 1405560 | 0000 | 0003 | 0000 | 0113 | 0000 | 0013 | 000d | f415 | 000d | f42e | 0200 | 0ad7 | 000d | f3fd | 000d | cd11 | 0200 | 17a7 | 0000 | 0003 | 0000 | 011b | 000d | f435 |
| 1405640 | 000d | f44e | 0200 | 0ad7 | 000d | f421 | 000d | c7c1 | 0200 | 17a7 | 0000 | 0003 | 0000 | 0123 | 000d | f455 | 000d | f46e | 0200 | 0ad7 | 000d | f441 | 000d | c7a1 |
| 1405720 | 0200 | 17a7 | 0000 | 0003 | 0000 | 012b | 000d | f475 | 000d | f492 | 0200 | 0ad7 | 000d | f461 | 000d | c6d5 | 0200 | 17a7 | 0000 | 0003 | 0000 | 0133 | 0000 | 0013 |
| 1406000 | 000d | f499 | 000d | f4b2 | 0200 | 0ad7 | 000d | f481 | 000d | cd3d | 0200 | 17a7 | 0000 | 0003 | 0000 | 013b | 000d | f4b9 | 000d | f4d2 | 0200 | 0ad7 | 000d | f4a5 |
| 1406060 | 000d | c731 | 0200 | 17a7 | 0000 | 0003 | 0000 | 0143 | 000d | f4d9 | 000d | f4f2 | 0200 | 0ad7 | 000d | f4c5 | 000d | c711 | 0200 | 17a7 | 0000 | 0003 | 0000 | 014b |
| 1406140 | 000d | f4f9 | 000d | f516 | 0200 | 0ad7 | 000d | f4e5 | 000d | c645 | 0200 | 17a7 | 0000 | 0003 | 0000 | 0153 | 0000 | 0013 | 000d | f51d | 000d | f536 | 0200 | 0ad7 |
| 1406220 | 000d | f505 | 000d | cd69 | 0200 | 17a7 | 0000 | 0003 | 0000 | 015b | 000d | f53d | 000d | f556 | 0200 | 0ad7 | 000d | f529 | 000d | c6a1 | 0200 | 17a7 | 0000 | 0003 |
| 1406300 | 0000 | 0163 | 000d | f55d | 000d | f576 | 0200 | 0ad7 | 000d | f549 | 000d | c681 | 0200 | 17a7 | 0000 | 0003 | 0000 | 016b | 000d | f57d | 000d | f59a | 0200 | 0ad7 |
| 1406360 | 000d | f569 | 000d | c5b5 | 0200 | 17a7 | 0000 | 0003 | 0000 | 0173 | 0000 | 0013 | 000d | f5a1 | 000d | f5ba | 0200 | 0ad7 | 000d | f589 | 000d | cd95 | 0200 | 17a7 |
| 1406440 | 0000 | 0003 | 0000 | 017b | 000d | f5c1 | 000d | f5da | 0200 | 0ad7 | 000d | f5ad | 000d | c611 | 0200 | 17a7 | 0000 | 0003 | 0000 | 0183 | 000d | f5e1 | 000d | f5fa |
| 1406520 | 0200 | 0ad7 | 000d | f5cd | 000d | c5f1 | 0200 | 17a7 | 0000 | 0003 | 0000 | 018b | 000d | f601 | 000d | f61e | 0200 | 0ad7 | 000d | f5ed | 000d | c525 | 0200 | 17a7 |
| 1406600 | 0000 | 0003 | 0000 | 0193 | 0000 | 0013 | 000d | f625 | 000d | f63e | 0200 | 0ad7 | 000d | f60d | 000d | cdc1 | 0200 | 17a7 | 0000 | 0003 | 0000 | 019b | 000d | f645 |
| 1406660 | 000d | f65e | 0200 | 0ad7 | 000d | f631 | 000d | c581 | 0200 | 17a7 | 0000 | 0003 | 0000 | 01a3 | 000d | f665 | 000d | f67e | 0200 | 0ad7 | 000d | f651 | 000d | c561 |
| 1406740 | 0200 | 17a7 | 0000 | 0003 | 0000 | 01ab | 000d | f685 | 000d | f6a2 | 0200 | 0ad7 | 000d | f671 | 000d | c495 | 0200 | 17a7 | 0000 | 0003 | 0000 | 01b3 | 0000 | 0013 |
| 1407020 | 000d | f6a9 | 000d | f6c2 | 0200 | 0ad7 | 000d | f691 | 000d | cded | 0200 | 17a7 | 0000 | 0003 | 0000 | 01bb | 000d | f6c9 | 000d | f6e2 | 0200 | 0ad7 | 000d | f6b5 |
| 1407100 | 000d | c4f1 | 0200 | 17a7 | 0000 | 0003 | 0000 | 01c3 | 000d | f5e9 | 000d | f702 | 0200 | 0ad7 | 000d | f6d5 | 000d | c4d1 | 0200 | 17a7 | 0000 | 0003 | 0000 | 01cb |
| 1407160 | 000d | f709 | 000d | f726 | 0200 | 0ad7 | 000d | f6f5 | 000d | c405 | 0200 | 17a7 | 0000 | 0003 | 0000 | 01d3 | 0000 | 0013 | 000d | f72d | 000d | f746 | 0200 | 0ad7 |
| 1407240 | 000d | f715 | 000d | ce19 | 0200 | 17a7 | 0000 | 0003 | 0000 | 01db | 000d | f74d | 000d | f766 | 0200 | 0ad7 | 000d | f739 | 000d | c461 | 0200 | 17a7 | 0000 | 0003 |
| 1407320 | 0000 | 01e3 | 000d | f76d | 000d | f786 | 0200 | 0ad7 | 000d | f759 | 000d | c441 | 0200 | 17a7 | 0000 | 0003 | 0000 | 01eb | 000d | f78d | 000d | f7aa | 0200 | 0ad7 |
| 1407400 | 000d | f779 | 000d | c375 | 0200 | 17a7 | 0000 | 0003 | 0000 | 01f3 | 0000 | 0013 | 000d | f7b1 | 000d | f7ca | 0200 | 0ad7 | 000d | f799 | 000d | ce45 | 0200 | 17a7 |
| 1407460 | 0000 | 0003 | 0000 | 01fb | 000d | f7d1 | 000d | f7ea | 0200 | 0ad7 | 000d | f7bd | 000d | c3d1 | 0200 | 17a7 | 0000 | 0003 | 0000 | 0203 | 000d | f7f1 | 000d | f80a |
| 1407540 | 0200 | 0ad7 | 000d | f7dd | 000d | c3b1 | 0200 | 17a7 | 0000 | 0003 | 0000 | 020b | 000d | f811 | 000d | f82e | 0200 | 0ad7 | 000d | f7fd | 000d | c2e5 | 0200 | 17a7 |
| 1407620 | 0000 | 0003 | 0000 | 0213 | 0000 | 0013 | 000d | f835 | 000d | f84e | 0200 | 0ad7 | 000d | f81d | 000d | ce71 | 0200 | 17a7 | 0000 | 0003 | 0008 | c02c | 0400 | 2287 |
| 1407700 | 0000 | 2287 | 0000 | 0010 | 000e | 2080 | 000e | 2080 | 0001 | 0055 | 0000 | 0000 | 000d | f960 | 0000 | 0058 | b288 | b66c | 0000 | 0445 | 7fff | ffff | 000e | 1ff4 |
| 1407760 | 0200 | 0db5 | 0100 | 15ad | 0100 | 33fd | 0000 | 000b | 0000 | 315f | 000d | f960 | 0000 | 002c | b288 | b66c | 0000 | 0445 | 7fff | ffff | 000d | f870 | 0200 | 0db5 |
| 1410040 | 0100 | 15ad | 0100 | 33fd | 0000 | 000b | 0000 | 315f | 0000 | 0034 | 000c | 7260 | b27c | b66c | 0000 | 0446 | 7fff | ffff | 000d | f8fc | 0200 | 0db5 | 0400 | 24ad |
| 1410120 | 0000 | 498f | 0000 | 0013 | 0000 | 2287 | 0000 | 4987 | 0000 | 315f | 0000 | 0034 | 000d | f8c8 | b27c | b66c | 0000 | 0447 | 7fff | ffff | 000d | f930 | 0200 | 0db5 |
| 1410200 | 0400 | 24ad | 0000 | 4997 | 0000 | 000b | 0000 | 2287 | 0000 | 4987 | 0000 | 315f | 0000 | 0034 | 000d | f8fc | b27c | b66c | 0000 | 0448 | 7fff | ffff | 000f | 6258 |
| 1410260 | 0200 | 0db5 | 0400 | 24ad | 0000 | 4997 | 0000 | 0013 | 0000 | 2287 | 0000 | 4987 | 0000 | 315f | 000d | fa38 | 0000 | 009c | b27c | b66c | 0000 | 0449 | 0000 | 0450 |
| 1410340 | 000d | f9c8 | 0200 | 0db5 | 0500 | 1cdd | 0000 | 2def | 0000 | 000b | 0000 | 2287 | 0071 | 0103 | 0000 | 02ab | 0000 | 315f | 000d | f9c4 | 0000 | 002c | b4f0 | b4e4 |
| 1410420 | 0000 | 0448 | 7fff | ffff | 0008 | b0dd | 0000 | 0000 | 0000 | 0000 | 000d | f9c8 | 0002 | 438a | 000e | 20e4 | 000d | fa7c | 0000 | 0038 | b130 | b66c | 0000 | 044b |
| 1410500 | 0000 | 0451 | 000d | f99d | 0200 | 0db5 | 0500 | 1cdd | 0000 | 2287 | 0000 | 0023 | 0000 | 2287 | 006f | c2c3 | 0000 | 02ab | 0000 | 315f | 2c78 | 003c | 0002 | 438a |
| 1410560 | 2520 | 46ec | 33a0 | 442c | 0200 | 6217 | 6b48 | 671c | 44a0 | 0000 | 0200 | 0daf | 4b8c | 0000 | 0000 | 3287 | 6c34 | 247c | 0008 | c03c | 0014 | 37f0 | 3cf4 | 234c |
| 1410640 | 000d | 8048 | 000d | fa7c | 0000 | 0038 | b27c | b66c | 0000 | 0a0a | 0000 | 0a47 | 0011 | 978c | 0200 | 0db5 | 0500 | 1cdd | 0000 | 622f | 0000 | 001b | 0000 | 3287 |
| 1410720 | 0090 | 8883 | 0000 | 033b | 0000 | 315f | 0007 | 6964 | 5f74 | 7770 | 6500 | 0000 | 000e | 21e0 | 0000 | 1df8 | 616c | 2c47 | 6f61 | 6c73 | 3029 | 2c20 | 476f | 616c |
| 1411000 | 7329 | 2e0a | 0a0a | 2a2f | 0a3a | 2d20 | 6d6f | 6475 | 6c65 | 2873 | 6f66 | 7374 | 6b2c | 205b | 0a09 | 7361 | 7665 | 5f69 | 6e73 | 7461 | 6e63 | 6573 | 2f32 | 2c09 |
| 1411060 | 2520 | 5465 | 6d70 | 6c61 | 7465 | 2078 | 2047 | 656e | 6572 | 6174 | 6f72 | 202d | 3e0a | 0973 | 6176 | 655f | 696e | 7374 | 616e | 6365 | 732f | 332c | 0925 | 204b |
| 1411140 | 6579 | 2078 | 2054 | 656d | 706c | 6174 | 6520 | 7820 | 4765 | 6e65 | 7261 | 746f | 7220 | 2d3e | 0a09 | 6c69 | 7374 | 5f69 | 6e73 | 7461 | 6e63 | 6573 | 2f31 | 2c09 |
| 1411220 | 2520 | 2d3e | 204c | 6973 | 740a | 096c | 6973 | 745f | 696e | 7374 | 616e | 6365 | 732f | 322c | 0925 | 2041 | 6363 | 756d | 756c | 6174 | 6f72 | 202d | 3e20 | 4c69 |
| 1411300 | 7374 | 0a09 | 6c69 | 7374 | 5f69 | 6e73 | 7461 | 6e63 | 6573 | 2f33 | 2c09 | 2520 | 4b65 | 7920 | 7820 | 4c65 | 6e67 | 7468 | 202d | 3e20 | 4c69 | 7374 | 0a09 | 636f |
| 1411360 | 6e6a | 5f69 | 6e73 | 7461 | 6e63 | 6573 | 2f32 | 2c09 | 2520 | 4b65 | 7920 | 2d3e | 2047 | 6f61 | 6c0a | 096d | 616b | 655f | 6b65 | 792f | 3309 | 0925 | 2056 | 6172 |
| 1411440 | 7320 | 2d3e | 204c | 656e | 6774 | 6820 | 7820 | 4b65 | 790a | 2020 | 205d | 292e | 0a3a | 2d20 | 6d65 | 7461 | 5f70 | 7265 | 6469 | 6361 | 7465 | 0a09 | 7351 | 7665 |
| 1411520 | 5f69 | 6e73 | 7461 | 6e63 | 6573 | 282b | 2c20 | 3029 | 2c0a | 0973 | 6176 | 655f | 696e | 7374 | 616e | 6365 | 7328 | 2b2c | 202b | 2c20 | 3029 | 2e0a | 0a3a | 2d20 |
| 1411600 | 6d6f | 6465 | 0a09 | 6c69 | 7374 | 5f69 | 6e73 | 7461 | 6e63 | 6573 | 282b | 2c20 | 2d29 | 2c0a | 096c | 6973 | 745f | 696e | 7374 | 616e | 6365 | 7328 | 2b2c | 202b |
| 1411660 | 2c20 | 2d29 | 2e0a | 0a3a | 2d20 | 6479 | 6e61 | 6d69 | 630a | 0973 | 6574 | 6f66 | 5f73 | 7461 | 636b | 2f32 | 2e0a | 0a73 | 6363 | 735f | 6964 | 2827 | 2240 | 2823 |
| 1411740 | 2938 | 392f | 3036 | 2f30 | 3120 | 736f | 6673 | 746b | 2e70 | 6c09 | 3332 | 2e31 | 2227 | 292e | 0a0a | 0a2f | 2a20 | 2049 | 6e20 | 7468 | 6520 | 6669 | 7273 | 7420 |
| 1412020 | 6472 | 6166 | 7420 | 6f66 | 2074 | 6869 | 7320 | 6669 | 6c65 | 2c20 | 7468 | 6520 | 696e | 7465 | 6e74 | 696f | 6e20 | 7761 | 7320 | 746f | 2075 | 7365 | 0a09 | 7365 |
| 1412100 | 746f | 665f | 7374 | 6163 | 6b28 | 5465 | 726d | 290a | 2020 | 2020 | 7768 | 6572 | 6520 | 5465 | 726d | 2069 | 7320 | 5b5d | 206f | 7220 | 666f | 756e | 6428 | 496e |
| 1412160 | 7374 | 616e | 6365 | 2920 | 6f72 | 204b | 6579 | 2d49 | 6e73 | 7461 | 6e63 | 652e | 0a20 | 2020 | 2048 | 6f77 | 6576 | 6572 | 2c20 | 7468 | 6973 | 2069 | 6e76 | 6f6c |

| | | | | | | | | | | | | | | | | | | | | | | | | |
|---|---|---|---|---|---|---|---|---|---|---|---|---|---|---|---|---|---|---|---|---|---|---|---|---|
| 1412240 | 7665 | 7320 | 696e | 6465 | 7869 | 6e67 | 206f | 6e20 | 7468 | 6520 | 6675 | 6e63 | 746f | 722c | 2077 | 6869 | 6368 | 2069 | 7320 | 7261 | 7468 | 6572 | 0a20 | 2020 |
| 1412320 | 2070 | 6f69 | 6e74 | 6c65 | 7373 | 2068 | 6572 | 652e | 2020 | 536f | 2074 | 6865 | 2063 | 7572 | 7265 | 6e74 | 2076 | 6572 | 7369 | 6f6e | 2075 | 7365 | 730a | 0973 |
| 1412400 | 6574 | 6f66 | 5f73 | 7461 | 636b | 285f | 2c20 | 5465 | 726d | 290a | 2020 | 2020 | 746f | 2061 | 766f | 6964 | 2069 | 6e64 | 6578 | 696e | 672e | 2020 | 5468 | 6520 |
| 1412460 | 6c6f | 772d | 6c65 | 7665 | 6c20 | 6f70 | 6572 | 6174 | 696f | 6e20 | 7768 | 6963 | 6820 | 7375 | 7070 | 6f72 | 7473 | 2074 | 6865 | 0a20 | 2020 | 2062 | 7569 | 6c74 |
| 1412540 | 2d69 | 6e20 | 6f70 | 6572 | 6174 | 696f | 6e73 | 2073 | 6574 | 6f66 | 2f33 | 2061 | 6e64 | 2062 | 6167 | 6f66 | 2f33 | 2069 | 7320 | 6d6f | 7265 | 2074 | 6861 | 6e20 |
| 1412620 | 3320 | 7469 | 6d65 | 730a | 2020 | 2020 | 6661 | 7374 | 6572 | 2074 | 6861 | 6e20 | 7468 | 6520 | 7665 | 7273 | 696f | 6e20 | 6f66 | 2066 | 696e | 6461 | 6c6c | 2f33 |
| 1412700 | 2069 | 6e20 | 7468 | 6973 | 206c | 6962 | 7261 | 7279 | 2e0a | 2a2f | 0a0a | 2520 | 2020 | 7361 | 7665 | 5f69 | 6e73 | 7461 | 6e63 | 6573 | 282b | 5465 | 6d70 | 6c61 |
| 1412760 | 7465 | 2c20 | 2b47 | 656e | 6572 | 6174 | 6f72 | 290a | 2520 | 2020 | 656e | 756d | 6572 | 6174 | 6573 | 2061 | 6c6c | 2070 | 726f | 7661 | 626c | 6520 | 696e | 7374 |
| 1413040 | 616e | 6365 | 7320 | 6f66 | 2074 | 6865 | 2047 | 656e | 6572 | 6174 | 6f72 | 2061 | 6e64 | 2073 | 746f | 7265 | 7320 | 7468 | 650a | 2520 | 2020 | 6173 | 736f | 6369 |
| 1413120 | 6174 | 6564 | 2054 | 6561 | 706c | 6174 | 6520 | 696e | 7374 | 616e | 6365 | 732e | 2020 | 4e65 | 6974 | 6865 | 7220 | 6172 | 6775 | 6d65 | 6e74 | 2065 | 6e64 | 7320 |
| 1413200 | 7570 | 2063 | 6861 | 6e67 | 6564 | 2e0a | 0a73 | 6176 | 655f | 696e | 7374 | 616e | 6365 | 7328 | 5465 | 6d70 | 6c61 | 7465 | 2c20 | 4765 | 6e65 | 7261 | 746f | 7229 |
| 1413260 | 203a | 2d0a | 0961 | 7373 | 6572 | 7461 | 2873 | 6574 | 6f66 | 5f73 | 7461 | 636b | 285f | 2c20 | 5b5d | 2929 | 2c0a | 0963 | 616c | 6c28 | 4765 | 6e65 | 7261 | 746f |
| 1413340 | 7229 | 2c0a | 0961 | 7373 | 6572 | 7461 | 2873 | 6574 | 6f66 | 5f73 | 7461 | 636b | 285f | 2c20 | 666f | 756e | 6428 | 5465 | 6d70 | 6c61 | 7465 | 2929 | 292c | 0a09 |
| 1413420 | 6661 | 696c | 2e0a | 7361 | 7665 | 5f69 | 6e73 | 7461 | 6e63 | 6573 | 285f | 2c20 | 5f29 | 2e0a | 0a0a | 0a25 | 2020 | 206c | 6973 | 745f | 696e | 7374 | 616e | 6365 |
| 1413500 | 7328 | 3f4c | 6973 | 7429 | 0a25 | 2020 | 2070 | 756c | 6c73 | 2061 | 6c6c | 2074 | 6865 | 2054 | 656d | 706c | 6174 | 6520 | 696e | 7374 | 616e | 6365 | 7320 | 6f75 |
| 1413560 | 7420 | 6f66 | 2074 | 6965 | 2064 | 6174 | 6120 | 6261 | 7365 | 2075 | 6e74 | 696c | 2069 | 740a | 2520 | 2020 | 6869 | 7473 | 2074 | 6865 | 206d | 6172 | 6b65 | 722c |
| 1413640 | 2061 | 6e64 | 2075 | 6e69 | 6669 | 6573 | 204c | 6973 | 7420 | 7769 | 7468 | 2074 | 6865 | 2072 | 6573 | 756c | 742e | 0a0a | 6c69 | 7374 | 5f69 | 6e73 | 7461 | 6e63 |
| 1413720 | 6573 | 284c | 6973 | 7429 | 203a | 2d0a | 096c | 6973 | 745f | 696e | 7374 | 616e | 6365 | 7328 | 5b5d | 2c20 | 4c69 | 7374 | 292e | 0a0a | 0a25 | 2020 | 206c | 6973 |
| 1414000 | 745f | 696e | 7374 | 616e | 6365 | 7328 | 2b53 | 6f46 | 6172 | 2c20 | 3f54 | 6f74 | 616c | 290a | 2520 | 2020 | 7075 | 6c6c | 7320 | 616c | 6c20 | 7468 | 6520 | 5465 |
| 1414060 | 6170 | 6c61 | 7465 | 2369 | 6e73 | 7461 | 6e63 | 6573 | 206f | 7574 | 206f | 6620 | 7468 | 6520 | 6461 | 7461 | 2062 | 6173 | 6520 | 756e | 7469 | 6c20 | 6974 | 0a25 |
| 1414140 | 2020 | 2068 | 6974 | 7320 | 7468 | 6520 | 6d61 | 726b | 6572 | 2c20 | 616e | 6420 | 7075 | 7473 | 2074 | 6865 | 6d20 | 6f6e | 2074 | 6865 | 2066 | 726f | 6e74 | 206f |
| 1414220 | 6620 | 7468 | 6520 | 6163 | 6375 | 6d75 | 6c61 | 746f | 720a | 2520 | 2020 | 536f | 4661 | 722e | 2020 | 5468 | 6973 | 2072 | 6f75 | 7469 | 6e65 | 2069 | 7320 | 7573 |
| 1414300 | 6564 | 2062 | 7920 | 6669 | 6e64 | 616c | 6c2f | 332d | 3420 | 616e | 6420 | 6279 | 2062 | 6167 | 5f6f | 6620 | 7768 | 656e | 0a25 | 2020 | 2074 | 6865 | 2047 | 656e |
| 1414360 | 6572 | 6174 | 6f72 | 2068 | 6173 | 206e | 6f20 | 6672 | 6565 | 2076 | 6172 | 6961 | 626c | 6573 | 2e0a | 0a6c | 6973 | 745f | 696e | 7374 | 616e | 6365 | 7328 | 536f |
| 1414440 | 4661 | 722c | 2054 | 6f74 | 616c | 2920 | 3a2d | 0a09 | 7265 | 7472 | 6163 | 7428 | 7365 | 746f | 665f | 7374 | 6163 | 6b28 | 5f2c | 2054 | 6572 | 6d29 | 292c | 0a09 |
| 1414520 | 212c | 0909 | 0909 | 2520 | 2020 | 6d75 | 7374 | 206e | 6f74 | 2062 | 6163 | 6b74 | 7261 | 636b | 0a09 | 276c | 6973 | 7420 | 696e | 7374 | 616e | 6365 | 7327 | 2854 |
| 1414600 | 6572 | 6d2c | 2053 | 6f46 | 6172 | 2c20 | 546f | 7461 | 6c29 | 2e0a | 0a0a | 276c | 6973 | 7420 | 696e | 7374 | 616e | 6365 | 7327 | 285b | 5d2c | 2054 | 6f74 | 616c |
| 1414660 | 2c20 | 546f | 7461 | 6c29 | 2e0a | 276c | 6973 | 7420 | 696e | 7374 | 616e | 6365 | 7327 | 2866 | 6f75 | 6e64 | 2854 | 656d | 706c | 6174 | 6529 | 2c20 | 536f | 4661 |
| 1414740 | 722c | 2054 | 6f74 | 616c | 2920 | 3a2d | 0a09 | 6c69 | 7374 | 5f69 | 6e73 | 7461 | 6e63 | 6573 | 285b | 5465 | 6d70 | 6c61 | 7465 | 7c53 | 6f46 | 6172 | 5d2c | 2054 |
| 1415020 | 6f74 | 616c | 292e | 0a0a | 0a0a | 2f2a | 2020 | 7361 | 7665 | 5f69 | 6e73 | 7461 | 6e63 | 6573 | 2f33 | 2061 | 6e64 | 206c | 6973 | 745f | 696e | 7374 | 616e | 6365 |
| 1415100 | 732f | 3320 | 6172 | 6520 | 7573 | 6564 | 2062 | 7920 | 6261 | 675f | 6f66 | 2f33 | 2061 | 6e64 | 0a20 | 2020 | 2073 | 6574 | 5f6f | 662f | 3320 | 7768 | 656e | 2074 |
| 1415160 | 6865 | 7265 | 2061 | 7265 | 2066 | 7265 | 6520 | 7661 | 7269 | 6162 | 6c65 | 7320 | 2877 | 6869 | 6368 | 2061 | 7265 | 2063 | 6f6c | 6c65 | 6374 | 6564 | 2061 | 730a |
| 1415240 | 2020 | 2020 | 7468 | 6520 | 4b65 | 7929 | 2e20 | 2054 | 6865 | 7920 | 6172 | 6520 | 6e6f | 7420 | 7573 | 6564 | 2062 | 7920 | 6569 | 7468 | 6572 | 2076 | 6572 | 7369 |
| 1415320 | 6f6e | 206f | 6620 | 6669 | 6e64 | 616c | 6c2e | 0a20 | 2020 | 2054 | 6965 | 7920 | 6172 | 6520 | 696e | 2074 | 6869 | 7320 | 6d6f | 6475 | 6c65 | 2073 | 6f20 | 7468 |
| 1415400 | 6174 | 2074 | 6865 | 7920 | 6361 | 6e20 | 7365 | 6520 | 7468 | 6520 | 7365 | 746f | 665f | 7374 | 6163 | 6b2f | 310a | 2020 | 2020 | 7072 | 6564 | 6963 | 6174 | 652e |
| 1415460 | 2020 | 5573 | 696e | 6720 | 7375 | 6368 | 2061 | 2070 | 7265 | 6469 | 6361 | 7465 | 2077 | 6173 | 2061 | 206e | 6577 | 2066 | 6561 | 7475 | 7265 | 2069 | 6e20 | 7468 |
| 1415540 | 650a | 2020 | 2020 | 322e | 3320 | 7265 | 6c65 | 6173 | 652c | 2077 | 6869 | 6368 | 2068 | 6173 | 2074 | 6865 | 2065 | 6666 | 6563 | 7420 | 7468 | 6174 | 2074 | 6865 |
| 1415620 | 2027 | 7265 | 636f | 7264 | 6564 | 2720 | 6461 | 7461 | 2062 | 6173 | 650a | 2020 | 2020 | 6973 | 206e | 6f77 | 2065 | 6e74 | 6972 | 656c | 7920 | 6672 | 6565 | 2074 |
| 1415700 | 6f20 | 6375 | 7374 | 6f6d | 6572 | 732e | 0a2a | 2f0a | 0a25 | 2020 | 2073 | 6176 | 655f | 696e | 7374 | 616e | 6365 | 7328 | 2b4b | 6579 | 2c20 | 2b54 | 656d | 706c |
| 1415760 | 6174 | 652c | 202b | 4765 | 6e65 | 7261 | 746f | 7229 | 0a25 | 2020 | 2065 | 6e75 | 6d65 | 7261 | 7465 | 7320 | 616c | 6c20 | 7072 | 6f76 | 6162 | 6c65 | 2069 | 6e73 |
| 1416040 | 7461 | 6e63 | 6573 | 206f | 6620 | 7468 | 6520 | 4765 | 6e65 | 7261 | 746f | 7220 | 616e | 6420 | 7374 | 6f72 | 6573 | 0a25 | 2020 | 2074 | 6865 | 2061 | 7373 | 6f63 |
| 1416120 | 6961 | 7465 | 6420 | 4b65 | 792d | 5465 | 6d70 | 6c61 | 7465 | 2069 | 6e73 | 7461 | 6e63 | 6573 | 2e20 | 204e | 6f6e | 6520 | 6f66 | 2074 | 6865 | 2061 | 7267 | 756d |
| 1416200 | 656e | 7473 | 0a25 | 2020 | 2065 | 6e64 | 7320 | 7570 | 2063 | 6861 | 6e67 | 6564 | 2e0a | 0a73 | 6176 | 655f | 696e | 7374 | 616e | 6365 | 7328 | 4b65 | 792c | 2054 |
| 1416260 | 656d | 706c | 6174 | 652c | 2047 | 656e | 6572 | 6174 | 6f72 | 2920 | 3a2d | 0a09 | 6173 | 7365 | 7274 | 6128 | 7365 | 746f | 665f | 7374 | 6163 | 6b28 | 5f2c | 205b |
| 1416340 | 5d29 | 292c | 0a09 | 6361 | 6c6c | 2847 | 656e | 6572 | 6174 | 6f72 | 292c | 0a09 | 6173 | 7365 | 7274 | 6128 | 7365 | 746f | 665f | 7374 | 6163 | 6b28 | 5f2c | 202d |
| 1416420 | 284b | 6579 | 2c54 | 656d | 706c | 6174 | 6529 | 2929 | 2c0a | 0966 | 6169 | 6c2e | 0a73 | 6176 | 655f | 696e | 7374 | 616e | 6365 | 7328 | 5f2c | 205f | 2c20 | 5f29 |
| 1416500 | 2e0a | 0a0a | 0a25 | 2020 | 206d | 616b | 655f | 6b65 | 7928 | 2b56 | 6172 | 732c | 202d | 4c65 | 6e67 | 7468 | 2c20 | 2d4b | 6579 | 290a | 2520 | 2020 | 6973 | 2067 |
| 1416560 | 6976 | 656e | 2061 | 206c | 6973 | 7420 | 5f66 | 2076 | 6172 | 6961 | 626c | 6573 | 2056 | 6172 | 732c | 2061 | 6e64 | 2063 | 6f6e | 7374 | 7275 | 6374 | 7320 | 6120 |
| 1416640 | 7465 | 726d | 2077 | 6869 | 6368 | 0a25 | 2020 | 2068 | 6f6c | 6473 | 2061 | 6c6c | 2074 | 686f | 7365 | 2076 | 6172 | 6961 | 626c | 6573 | 2e20 | 2049 | 6620 | 7468 |
| 1416720 | 6572 | 6520 | 6172 | 6520 | 7570 | 2074 | 6f20 | 3235 | 3020 | 7661 | 7269 | 6162 | 6c65 | 732c | 0a25 | 2020 | 2074 | 6865 | 2072 | 6573 | 756c | 7420 | 6973 | 2061 |
| 1417000 | 206f | 6e65 | 2d6c | 6576 | 656c | 2074 | 6572 | 6d2e | 2020 | 4966 | 2074 | 6865 | 7265 | 2061 | 7265 | 2062 | 6574 | 7765 | 656e | 2032 | 3530 | 2061 | 6e64 | 0a25 |
| 1417060 | 2020 | 2032 | 3530 | 2a32 | 3530 | 3d36 | 3235 | 3030 | 2076 | 6172 | 6961 | 626c | 6573 | 2c20 | 7468 | 6520 | 7265 | 7375 | 6c74 | 2069 | 7320 | 6120 | 7477 | 6f2d |
| 1417140 | 6c65 | 7665 | 6c20 | 7465 | 726d | 2e20 | 2054 | 6865 | 0a25 | 2020 | 206f | 7574 | 6572 | 2066 | 756e | 6374 | 6f72 | 2c20 | 6966 | 2061 | 6e79 | 2c20 | 6973 | 202a |
| 1417220 | 202f | 4e2c | 2061 | 6e64 | 2074 | 6865 | 2069 | 6e6e | 6572 | 2066 | 756e | 6374 | 6f72 | 2069 | 7320 | 2e20 | 2f4d | 2e0a | 2520 | 2020 | 4966 | 2074 | 6865 | 7265 |
| 1417300 | 2061 | 7265 | 206d | 6f72 | 6520 | 7468 | 616e | 2032 | 3530 | 2a32 | 3530 | 2076 | 6172 | 6961 | 626c | 6573 | 2c20 | 7468 | 6973 | 2070 | 7265 | 6469 | 6361 | 7465 |

```
1417360 2066 6169 6c73 2e0a 2520 2020 4974 2069 7320 7570 2074 6f20 7468 6520 6361 6c6c 6572 2074 6f20 7265 706f 7274 2074 6865
1417440 2065 7272 6f72 2e0a 0a6d 616b 655f 6b65 7928 5661 7273 2c20 4c65 6e67 7468 2c20 4b65 7929 203a 2d0a 096c 656e 6774 6828
1417520 5661 7273 2c20 4c65 6e67 7468 292c 0a09 2820 2020 4c65 6e67 7468 203d 3c20 2020 2020 3320 2d3e 206d 616b 655f 6b65 795f
1417600 3128 4c65 6e67 7468 2c20 5661 7273 2c2c 4b65 7929 0a09 3b20 2020 4c65 6e67 7468 203d 3c20 2020 3235 3020 2d3e 206d 616b
1417660 655f 6f6e 655f 6c65 7665 6c5f 6b65 7928 4c65 6e67 7468 2c20 5661 7273 2c20 4b65 792c 205b 5d29 0a09 3b20 2020 4c65 6e67
1417740 7468 203d 3c20 3632 3530 3020 2d3e 206d 616b 655f 7477 6f5f 6c65 7665 6c5f 6b65 7928 4c65 6e67 7468 2c20 5661 7273 2c20
1420020 4b65 7929 0a09 292e 0a0a 6d61 6b65 5f6b 6579 5f31 2831 2c20 5b58 315d 2c09 2e28 5831 2929 2e0a 6d61 6b65 5f6b 6579 5f31
1420100 2832 2c20 5b58 312c 5832 5d2c 092e 2858 312c 5832 2929 2e0a 6d61 6b65 5f6b 6579 5f31 2833 2c20 5b58 312c 5832 2c58 335d
1420160 2c09 2e28 5831 2c58 322c 5833 2929 2e0a 0a6d 616b 655f 6f6e 655f 6c65 7665 6c5f 6b65 7928 4c65 6e67 7468 2c20 5661 7273
1420240 2c20 4b65 792c 2056 6172 7331 2920 3a2d 0a09 6675 6e63 746f 7228 4b65 792c 202e 2c20 4c65 6e67 7468 292c 0a09 6d61 6b65
1420320 5f6f 6e65 5f6c 6576 656c 5f6b 6579 284c 656e 6774 682c 2056 6172 732c 2031 2c20 4b65 792c 2056 6172 7331 292e 0a0a 6d61
1420400 6b65 5f6f 6e65 5f6c 6576 656c 5f6b 6579 284c 656e 6774 682c 205b 5661 727c 5661 7273 5d2c 204e 2c20 4b65 792c 2056 6172
1420460 7331 2920 3a2d 0a09 2820 2020 4c65 6e67 7468 203e 2031 202d 3e0a 0920 2020 2061 7267 284e 2c20 4b65 792c 2056 6172 292c
1420540 0a09 2020 2020 4c65 6e67 7468 3120 6973 204c 656e 6774 682d 312c 0a09 2020 2020 4e31 2069 7320 4e2b 312c 0a09 2020 2020
1420620 6d61 6b65 5f6f 6e65 5f6c 6576 656c 5f6b 6579 284c 656e 6774 6831 2c20 5661 7273 2c20 4e31 2c20 4b65 792c 2056 6172 7331
1420700 290a 093b 2020 2061 7267 284e 2c20 4b65 792c 2056 6172 292c 0a09 2020 2020 5661 7273 3120 3d20 5661 7273 0a09 292e 0a0a
1420760 6d61 6b65 5f74 776f 5f6c 6576 656c 5f6b 6579 284c 656e 6774 682c 2056 6172 732c 204b 6579 2920 3a2d 0a09 4172 6974 7920
1421040 6973 2028 4c65 6e67 7468 2b32 3439 2920 2f2f 2032 3530 2c0a 0966 756e 6374 6f72 284b 6579 2c20 2a2c 2041 7269 7479 292c
1421120 0a09 6d61 6b65 5f74 776f 5f6c 6576 656c 5f6b 6579 284c 656e 6774 682c 2056 6172 732c 2031 2c20 4b65 7929 2e0a 0a6d 616b
1421200 655f 7477 6f5f 6c65 7665 6c5f 6b65 7928 4c65 6e67 7468 2c20 5661 7273 2c20 4e2c 204b 6579 2920 3a2d 0a09 2820 2020 4c65
1421260 6e67 7468 203e 2032 3530 202d 3e0a 0920 2020 206d 616b 655f 6f6e 655f 6c65 7665 6c5f 6b65 7928 3235 302c 2056 6172 732c
1421340 2041 7267 2c20 5661 7273 3129 2c0a 0920 2020 2061 7267 284e 2c20 4b65 792c 2041 7267 292c 0a09 2020 2020 4c65 6e67 7468
1421420 3120 6973 204c 656e 6774 682d 3235 302c 0a09 2020 2020 4e31 2069 7320 4e2b 312c 0a09 2020 2020 6d61 6b65 5f74 776f 5f6c
1421500 6576 656c 5f6b 6579 284c 656e 6774 6831 2c20 5661 7273 312c 204e 312c 204b 6579 290a 093b 2020 206d 616b 655f 6f6e 655f
1421560 6c65 7665 6c5f 6b65 7928 4c65 6e67 7468 2c20 5661 7273 2c20 4172 672c 205b 5d29 2c0a 0920 2020 2061 7267 284e 2c20 4b65
1421640 792c 2041 7267 290a 0929 2e0a 0a0a 0a25 2020 206c 6973 745f 696e 7374 616e 6365 7328 2b4b 6579 2c20 2b4c 656e 6774 682c
1421720 202d 4c69 7374 290a 2520 2020 7075 6c6c 7320 616c 6c20 7468 6520 4b65 792d 5465 6d70 6c61 7465 2069 6e73 7461 6e63 6573
1422000 206f 7574 206f 6620 7468 6520 6461 7461 2062 6173 6520 756e 7469 6c0a 2520 2020 6974 2068 6974 7320 7468 6520 6d61 726b
1422060 6572 2c20 616e 6420 756e 6966 6965 7320 7468 6520 7265 7375 6c74 2077 6974 6820 4c69 7374 2e0a 2520 2020 4e6f 7465 2074
1422140 6861 7420 6173 7365 7274 696e 6720 736f 6d65 7468 696e 6720 696e 746f 2074 6865 2064 6174 6120 6261 7365 2061 6e64 2070
1422220 756c 6c69 6e67 2069 7420 6f75 740a 2520 2020 6167 6169 6e20 7265 6e61 6d65 7320 616c 6c20 7468 6520 7661 7269 6162 6c65
1422300 733b 2074 6f20 636f 756e 7465 7261 6374 2074 6869 7320 7765 2075 7365 2072 6570 6c61 6365 5f0a 2520 2020 6b65 795f 7661
1422360 7269 6162 6c65 7320 746f 2070 7574 2074 6865 206f 6c64 2076 6172 6961 626c 6573 2062 6163 6b2e 2020 466f 7274 756e 6174
1422440 656c 7920 6966 2077 650a 2520 2020 6269 6e64 2058 3d59 2c20 7468 6520 6e65 7765 7220 7661 7269 6162 6c65 2077 696c 6c20
1422520 6265 2062 6f75 6e64 2074 6f20 7468 6520 6f6c 6465 722c 2061 6e64 2074 6865 0a25 2020 206f 7269 6769 6e61 6c20 6b65 7920
1422600 7661 7269 6162 6c65 7320 6172 6520 6775 6172 616e 7465 6564 2074 6f20 6265 206f 6c64 6572 2074 6861 6e20 7468 6520 6e65
1422660 7720 6f6e 6573 2e0a 2520 2020 5468 6973 2072 6570 6c61 6365 6d65 6e74 206d 7573 7420 6265 2064 6f6e 6520 4069 3c62 6566
1422740 6f72 653e 2074 6865 206b 6579 736f 7274 2e0a 0a25 2020 2054 6865 206d 616b 655f 7661 7269 6162 6c65 5f67 6c6f 6261 6c28
1423020 7b4c 6973 747d 2920 6861 636b 2067 6976 6573 2075 7320 6120 7761 7920 746f 2074 656c 6c0a 2520 2020 7768 6574 6865 7220
1423100 6120 7661 7269 6162 6c65 2069 6e20 6120 4b65 792d 5465 6d70 6c61 7465 2069 6e73 7461 6e63 6520 6973 206e 6577 206f 7220
1423160 6861 730a 2520 2020 616c 7265 6164 7920 6265 656e 2062 6f75 6e64 2074 6f20 6f6e 6520 6f66 2074 6865 2076 6172 6961 626c
1423240 6573 2069 6e20 7468 6520 6f72 6967 696e 616c 0a25 2020 204b 6579 2e20 2028 5468 6973 2066 6978 6573 2061 2062 7567 2077
1423320 6865 7265 2062 696e 6469 6e67 2074 776f 2076 6172 6961 626c 6573 2069 6e20 616e 0a25 2020 2069 6e73 7461 6e63 6520 636f
1423400 756c 6420 666f 7263 6520 7468 656d 2074 6f20 6265 2062 6f75 6e64 2069 6e20 616c 6c20 696e 7374 616e 6365 7321 2920 2054
1423460 6865 0a25 2020 204c 656e 6774 6820 6973 2070 6173 7365 6420 696e 2073 6f20 7468 6174 2077 6520 6b6e 6f77 2077 6865 7468
1423540 6572 2077 6520 6861 7665 2061 206f 6e65 2d6c 6576 656c 0a25 2020 206f 7220 6120 7477 6f2d 6c65 7665 6c20 6b65 792e 0a0a
1423620 6c69 7374 5f69 6e73 7461 6e63 6573 284b 6579 2c20 4c65 6e67 7468 2c20 4c69 7374 2920 3a2d 0a09 6d61 6b65 5f76 6172 6961
1423700 626c 655f 676c 6f62 616c 287b 4c69 7374 7d29 2c0a 0928 2020 204c 656e 6774 6820 3d3c 2032 3530 202d 3e0a 0920 2020 206c
1423760 6973 745f 696e 7374 616e 6365 735f 6f6e 6528 4b65 792c 204c 656e 6774 682c 205b 5d2c 204c 6973 7429 0a09 3b20 2020 4172
1424040 6974 7920 6973 2028 4c65 6e67 7468 2b32 3439 2920 2f2f 2032 3530 2c0a 0920 2020 206c 6973 745f 696e 7374 616e 6365 735f
1424120 7477 6f28 4b65 792c 2041 7269 7479 2c20 5b5d 2c20 4c69 7374 290a 0929 2e0a 0a0a 6d61 6b65 5f76 6172 6961 626c 655f 676c
1424200 6f62 616c 285f 292e 0a0a 0a0a 2520 2020 6c69 7374 5f69 6e73 7461 6e63 6573 5f6f 6e65 282b 4b65 792c 202b 4e2c 202b 4f6c
1424260 6442 6167 2c20 2d4e 6577 4261 6729 0a25 2020 2069 7320 7573 6564 2077 6865 6e20 7468 6520 6e75 6d62 6572 206f 6620 7661
1424340 7269 6162 6c65 7320 696e 204b 6579 2069 7320 4e20 616e 6420 6973 2061 7420 6d6f 7374 2032 3530 2e0a 2520 2020 5468 6174
1424420 2069 732c 2077 6865 6e20 7765 2068 6176 6520 6120 6f6e 652d 6c65 7665 6c20 6b65 792e 2020 5765 2062 7569 6c64 2074 6865
```

```
1424500  206c 6973 7420 7570 2069 6e0a 2520 2020 7265 7665 7273 6520 6f72 6465 722e 2020 5765 2072 656c 7920 6f6e 204e 6577 4261
1424560  6720 6265 696e 6720 6120 676c 6f62 616c 2075 6e62 6f75 6e64 2076 6172 6961 626c 652c 0a25 2020 2061 6e64 2075 7365 2069
1424640  7420 6173 2061 206d 6167 6963 206d 6172 6b65 7220 746f 2064 6563 6964 6520 7768 6963 6820 7661 7269 6162 6c65 7320 746f
1424720  2072 6570 6c61 6365 2e0a 0a6c 6973 745f 696e 7374 616e 6365 735f 6f6e 6528 4b65 792c 204e 2c20 4f6c 6442 6167 2c20 4e65
1425000  7742 6167 2920 3a2d 0a09 7265 7472 6163 7428 7365 746f 665f 7374 6163 6b28 5f2c 2054 6572 6d29 292c 0a09 212c 0909 0909
1425060  2520 206d 7573 7420 6e6f 7420 6261 636b 7472 6163 6b21 0a09 6c69 7374 5f69 6e73 7461 6e63 6573 5f6f 6e65 2854 6572 6d2c
1425140  204b 6579 2c20 4e2c 204f 6c64 4261 672c 204e 6577 4261 6729 2e0a 0a6c 6973 745f 696e 7374 616e 6365 735f 6f6e 6528 5b5d
1425220  2c20 5f2c 205f 2c20 416e 7342 6167 2c20 416e 7342 6167 292e 0a6c 6973 745f 696e 7374 616e 6365 735f 6f6e 6528 4e65 774b
1425300  6579 2d54 6572 6d2c 204b 6579 2c20 4e2c 204f 6c64 4261 672c 204e 6577 4261 6729 203a 2d0a 0972 6570 6c61 6365 5f6b 6579
1425360  5f76 6172 6961 626c 6573 5f6f 6e65 284e 2c20 4b65 792c 204e 6577 4261 672c 204e 6577 4b65 7929 2c0a 096c 6973 745f 696e
1425440  7374 616e 6365 735f 6f6e 6528 4b65 792c 204e 2c20 5b4e 6577 4b65 792d 5465 726d 7c4f 6c64 4261 675d 2c20 4e65 7742 6167
1425520  292e 0a0a 7265 706c 6163 655f 6b65 795f 7661 7269 6162 6c65 735f 6f6e 6528 4e2c 204f 6c64 4b65 792c 204d 6167 6963 4d61
1425600  726b 6572 2c20 4e65 774b 6579 2920 3a2d 0a09 2820 2020 4e20 3d3a 3120 3020 2d3e 2074 7275 650a 093b 2020 204d 2069 7320
1425660  4e2d 312c 0a09 2020 2020 6172 6728 4e2c 204e 6577 4b65 792c 2041 7267 292c 0a09 2020 2020 2820 2020 7661 7228 4172 6729
1425740  2c20 4172 6720 403e 204d 6167 6963 4d61 726b 6572 202d 3e0a 0909 6172 6728 4e2c 204f 6c64 4b65 792c 2041 7267 290a 0920
1426020  2020 203b 0974 7275 650a 0920 2020 2029 2c0a 0920 2020 2072 6570 6c61 6365 5f6b 6579 5f76 6172 6961 626c 6573 5f6f 6e65
1426100  284d 2c20 4f6c 644b 6579 2c20 4161 6769 634d 6172 6b65 722c 204e 6577 4b65 7929 0a09 292e 0a0a 0a25 2020 206c 6973 745f
1426160  696e 7374 616e 6365 735f 7477 6f28 2b4b 6579 2c20 2b4e 2c20 2b4f 6c64 4261 672c 202d 4e65 7742 6167 290a 2520 2020 6973
1426240  206c 696b 6520 6c69 7374 5f69 6e73 7461 6e63 6573 5f6f 6e65 2f34 2065 7863 6570 7420 7468 6174 204e 2069 7320 7468 6520
1426320  6172 6974 7920 6f66 2074 6865 0a25 2020 204b 6579 2c20 616e 6420 7468 6520 4b65 7920 6973 2061 2074 776f 2d6c 6576 656c
1426400  206b 6579 2e20 2054 6869 7320 7368 6f75 6c64 2061 6c6d 6f73 7420 6e65 7665 720a 2520 2020 6265 2075 7365 642e 2020 4e6f
1426460  7465 2074 6861 7420 4e65 7742 6167 2070 6c61 7973 2074 776f 2072 6f6c 6573 210a 0a6c 6973 745f 696e 7374 616e 6365 735f
1426540  7477 6f28 4b65 792c 204e 2c20 4f6c 6442 6167 2c20 4e65 7742 6167 2920 3a2d 0a09 7265 7472 6163 7428 7365 746f 665f 7374
1426620  6163 6b28 5f2c 2054 6572 6d29 292c 0a09 212c 0909 0909 2520 206d 7573 7420 6e6f 7420 6261 636b 7472 6163 6b21 0a09 6c69
1426700  7374 5f69 6e73 7461 6e63 6573 5f74 776f 2854 6572 6d2c 204b 6579 2c20 4e2c 204f 6c64 4261 672c 204e 6577 4261 6729 2e0a
1426760  0a6c 6973 745f 696e 7374 616e 6365 735f 7477 6f28 5b5d 2c20 5f2c 205f 2c20 416e 7342 6167 2c20 416e 7342 6167 292e 0a6c
1427040  6973 745f 696e 7374 616e 6365 735f 7477 6f28 4e65 774b 6579 2d54 6572 6d2c 204b 6579 2c20 4e2c 204f 6c64 4261 672c 204e
1427120  6577 4261 6729 203a 2d0a 0972 6570 6c61 6365 5f6b 6579 5f76 6172 6961 626c 6573 5f74 776f 284e 2c20 4b65 792c 204e 6577
1427200  4261 672c 204e 6577 4b65 7929 2c0a 096c 6973 745f 696e 7374 616e 6365 735f 7477 6f28 4b65 792c 204e 2c20 5b4e 6577 4b65
1427260  792d 5465 726d 7c4f 6c64 4261 675d 2c20 4e65 7742 6167 292e 0a0a 7265 706c 6163 655f 6b65 795f 7661 7269 6162 6c65 735f
1427340  7477 6f28 4e2c 204f 6c64 4b65 792c 204d 6167 6963 4d61 726b 6572 2c20 4e65 774b 6579 2920 3a2d 0a09 6172 6728 4e2c 204f
1427420  6c64 4b65 792c 204f 6c64 4172 6729 2c0a 0961 7267 284e 2c20 4e65 774b 6579 2c20 4e65 7741 7267 292c 0a09 6675 6e63 746f
1427500  7228 4e65 7741 7267 2c20 2e2c 2041 7269 7479 292c 0a09 7265 706c 6163 655f 6b65 795f 7661 7269 6162 6c65 735f 6f6e 6528
1427560  4172 6974 792c 204f 6c64 4172 672c 204d 6167 6963 4d61 726b 6572 2c20 4e65 7741 7267 292c 0a09 2820 2020 4e20 3d3a 3d20
1427640  3120 2d3e 2074 7275 650a 093b 2020 204d 2069 7320 4e2d 312c 0a09 2020 2020 7265 706c 6163 655f 6b65 795f 7661 7269 6162
1427720  6c65 735f 7477 6f28 4d2c 204f 6c64 4b65 000c 1b8c 0200 498f 0000 4987 0000 0008 000d 8b60 000d 832c 0001 0056 0000 0000
1430000  000e 1870 0300 499f 0000 4987 0000 000c 000d 8ce4 000d 7268 0001 0056 0000 0000 000c 1c2c 0100 4997 0000 4987 0000 0004
1430060  000e 1a30 000e 1a30 0001 0056 0000 0000 000e 18b0 0200 4997 0000 4987 0000 0008 000d 8c38 000d 8c38 0001 0056 0000 0000
1430140  000e 18d0 0300 4997 0000 4987 0000 000c 000d 90e0 000d 90e0 0001 0056 0000 0000 000c 1d7c 0200 49bf 0000 4987 0000 0008
1430220  000e 1ecc 000e 1ecc 0001 0056 0000 0000 0008 d18c 0300 49c7 0000 4987 0000 000c 000d 8d88 000d 8d88 0001 0056 0000 0000
1430300  0008 d1ac 0200 49cf 0000 4987 0000 0008 000a 18f0 0002 438a 0003 0056 0000 0000 0000 0028 000d c814 b27c b66c 0000 0412
1430360  7fff ffff 000e 2038 0200 0db5 0100 32b5 0000 4987 0000 315f 001d 2240 2823 2938 392f 3036 2f30 3120 736f 6673 746b 2e70
1430440  6c09 3332 2e31 2200 000d c7ec 0100 2def 0000 4987 0000 0004 000e 1a04 000e 1a04 0001 0056 0000 0000 0010 a4c4 000c 0208
1430520  0010 a550 000c afb4 000e 1aa4 000e 1ae0 2c78 0012 0002 438a 4e1c 0000 0000 49d7 228c 0ad7 2cac 19ed 0002 438a 2ca0 17a7
1430600  0000 0000 0000 0001 000e 19f0 000e 19f0 0002 438a 000d d3b0 0005 666f 756e 6400 2c78 0014 0002 438a 35c8 4354 239c 0000
1430660  000e 18e0 000e 6c69 7374 2069 6e73 7461 6e63 6573 0000 0a5b ffff ffff 0300 49e7 0000 4987 0000 000c 000e 1aac 000e 1aac
1430740  0001 0056 0000 0000 000e 1b6c 0400 49ff 0000 4987 0000 0010 000d 9034 000d 9034 0001 0056 0000 0000 27f0 0014 000e 1ad4
1431020  4e1c 0000 0000 0007 4960 228c 2cac 9e01 0002 438a 2ca0 0003 0000 0004 0000 0002 000e 1a98 000e 1ad4 0002 438a 000e 19e8
1431100  000e 464c 2954 0028 0002 438a 5d10 0000 0100 49df 67ec 0018 36a4 35ec 4538 6c84 0018 6c08 239c 0000 000e 18e0 0012 6d61
1431160  6b65 5f6f 6e65 5f6c 6576 656c 5f6b 6579 000d 9d91 0012 6d61 6b65 5f74 776f 5f6c 6576 656c 5f6b 6579 0000 0ad7 ffff ffff
1431240  0300 49ef 0000 4987 0000 000c 000e 1bbc 000e 1bbc 0001 0056 0000 0000 000b 3fb4 0400 49f7 0000 4987 0000 0010 000d 8e7c
1431320  000d 8e7c 0001 0056 0000 0000 000b 3fe4 0300 49ff 0000 4987 0000 000c 000d 8fc4 000d 8fc4 0001 0056 0000 0000 0012 9a68
1431400  000b 80e0 000e 1ddc 000d 7010 27f0 0020 000e 1be0 4e1c 0000 0000 000b 5758 671c 5370 5bc4 0100 000f 6b74 228c 2cac 0003
1431460  0002 438a 2ca0 1bcd 0000 000c 0000 0003 000e 1b9c 000d 8e18 0002 438a 000e 1c0c 28c4 0022 000d 8e18 4e1c 0000 0000 0013
1431540  5758 6750 55f0 671c 5370 57b8 6bb4 6b74 228c 0003 000e 1dc5 0000 0000 0000 0000 000e 1ba8 000e 1bec 000d 8e24 000c 706c
```

```
1431620  7573 5f74 6f5f 6c69 7374 0000 000e 1b4c 0500 49f7 0000 4987 0000 0014 000d 8ee4 000d 8ee4 0001 0056 0000 0000 000a 6c69
1431700  7374 5f74 6f5f 6f72 0000 0000 0014 6d61 6b65 5f76 6172 6961 626c 655f 676c 6f62 616c 008e 0012 6c69 7374 5f69 6e73 7461
1431760  6e63 6573 5f6f 6e65 0000 0ae3 0012 6c69 7374 5f69 6e73 7461 6e63 6573 5f74 776f 0000 17a7 006b 4268 0100 4a07 0000 4987
1432040  0000 0004 000d 8248 000d 8248 0001 0056 0000 0000 000b 4404 0400 4a0f 0000 4987 0000 0010 000d 919c 000d 919c 0001 0056
1432120  0000 0000 000b 4328 0400 4a17 0000 4987 0000 0010 000d 9340 000d 9340 0001 0056 0000 0000 000b 6c69 7374 5f74 6f5f 616e
1432200  6400 0000 000b 616e 645f 746f 5f6c 6973 7400 0000 000e 1cc4 0500 4a0f 0000 4987 0000 0014 000e 1d5c 000e 1d5c 0001 0056
1432260  0000 0000 27f0 0016 000d 9218 4e1c 0000 0000 0007 4348 0018 228c 0ad7 2cac 1d45 0002 438a 2ca0 17a7 0000 0004 0000 0002
1432340  000e 1d44 000d 9218 0002 438a 000e 1c04 0019 7265 706c 6163 655f 6b65 795f 7661 7269 6162 6c65 735f 6f6e 6500 000b 44c0
1432420  0400 4a1f 0000 4987 0000 0010 000d 92a4 000d 92a4 0001 0056 0000 0000 000e 1d50 0000 0000 000d 9224 000e 1dbc 000a 6669
1432500  6e64 616c 6c2e 706c 0000 0000 0000 2297 b328 1dc9 000e 203c 0000 0000 0002 7e4e 0000 0000 0005 5167 4e75 6d00 000e 1ce4
1432560  0500 4a17 0000 4987 0000 0014 000e 1e34 000e 1e34 0001 0056 0000 0000 27f0 0016 000d 93bc 4e1c 0000 0000 0007 4a48 0018
1432640  228c 0003 2cac 0b4b 0002 438a 2ca0 1e5a 0000 0004 0000 0002 000e 1e1c 000d 93bc 0002 438a 000e 1e94 0019 7265 706c 6163
1432720  655f 6b65 795f 7661 7269 6162 6c65 735f 7477 6f00 000b 4560 0400 4a27 0000 4987 0000 0010 000d 9448 000d 9448 0001 0056
1433000  0000 0000 000e 1ea5 0000 0000 000e 1e28 0000 0000 000d 93c8 000e 1e9c 0000 4997 b464 17a7 000d f900 000d 8260 0000 498f
1433060  b328 1ede 000d f8cc 0000 0000 2c78 0018 0002 438a 3640 41e8 0000 315f 239c 0000 000e 1ef4 000e 1910 0300 49bf 0000 4987
1433140  0000 000c 000d 9524 000d 9524 0001 0056 0000 0000 000e 1ee4 0400 49bf 0000 4987 0000 0010 000e 1f38 000e 1f38 0001 0056
1433220  0000 0000 27f0 0014 000d 9598 4e1c 0000 0000 0007 49c8 228c 2cac 0003 0002 438a 2ca0 1f49 0000 0004 0000 0002 000e 1f24
1433300  000d 9598 0002 438a 000e 1f5c 000e 1f6d 0000 0000 000e 1f30 0000 0000 000d 95a4 000e 1f64 000f 6c69 7374 5f74 6f5f 6269
1433360  6e61 7279 4c00 0000 000f 6c69 7374 5f74 5f5f 6269 6e61 7279 5200 1f74 0014 8764 000c 0e70 2b24 842c 0002 438a 000e 4776
1433440  0007 6374 725f 7661 6c00 0000 b464 1fb4 000d dc88 0000 0000 b464 1fc0 000d dc20 0000 0000 b464 d82c 000b 086c 000d 7078
1433520  0009 736f 6673 746b 2e70 6c00 001e 2240 2823 2938 392f 3131 2f31 3320 6669 6e64 616c 6c2e 706c 0933 362e 3122 0000 0007
1433600  000e 19b8 0100 2def 0000 2287 0000 0004 000e 2058 000e 2058 0001 0055 0000 0000 0000 0028 000e 1978 b27c b66c 0000 044a
1433660  7fff ffff 000e 41d8 0200 0db5 0100 32b5 0000 2287 0000 315f 2cac 97d1 0002 438a 2ca0 0003 0000 0000 0000 0001 000d 8848
1433740  000d 8848 0002 438a 000e 207c 000d 8854 2c78 001c 0002 438a 2520 4740 47bc 247c 000e 1880 0014 2330 000e 18e0 000d f848
1434020  0400 2287 0000 3287 0000 0010 000e 20bc 000e 20bc 0041 0000 0000 0000 2c78 0028 0002 438a 370c 0018 44a0 0000 0200 0daf
1434100  4b8c 0000 0000 3287 6c48 0018 239c 0000 000d f858 c027 2f68 6f6d 652f 6f73 6173 322f 622f 7175 696e 7475 732f 7077 312e
1434160  312f 6c69 6272 6172 792f 6374 7200 315f 002a 2f68 6f6d 652f 6f73 6173 322f 622f 7175 696e 7475 732f 7077 312e 312f 6c69
1434240  6272 6172 792f 6374 722e 706c 006f 7365 0032 2f68 6f6d 652f 6f73 6173 322f 622f 7175 696e 7475 732f 6765 6e65 7269 632f
1434320  7170 6c69 6232 2e35 2f6c 6962 7261 7279 2f63 7472 0061 636b 0035 2f68 6f6d 652f 6f73 6173 322f 622f 7175 696e 7475 732f
1434400  6765 6e65 7269 632f 7170 6c69 6232 2e35 2f6c 6962 7261 7279 2f63 7472 2e70 6c00 002c 000e 4c08 b27c b66c 0000 0491
1434460  7fff ffff 000d d950 0200 0db5 0200 2f35 0000 4b07 0000 02c3 0000 315f 000e 244c 0000 006c 4e1c 0000 0000 4bd7 5d7c 0000
1434540  0200 4bd7 6160 5b58 0100 0ab7 4b8c 0000 0000 229f 56f8 671c 5370 5aec 0100 0ad7 4b8c 0000 0000 229f 228c 315f 000e 244c
1434620  0000 002c b27c b66c 0000 0493 0000 04b4 000a d16d 0200 0db5 0200 270d 0000 4b07 0000 4ae7 0000 315f 0000 002c 000d d9e8
1434700  b27c b66c 0000 0495 7fff ffff 000e 4ca0 0200 0db5 0200 284d 0000 4ae7 0000 4b07 0000 315f 0000 0034 000d dc84 b27c b66c
1434760  0000 0496 7fff ffff 000e 22b0 0200 0db5 0400 242d 0000 4b0f 0000 0013 0000 4ae7 0000 21cf 0000 315f 0000 0034 000e 227c
1435040  b27c b66c 0000 0497 7fff ffff 000e 22e4 0200 0db5 0400 242d 0000 4b0f 0000 001b 0000 4ae7 0000 21cf 0000 315f 0000 0034
1435120  000e 22b0 b27c b66c 0000 0498 7fff ffff 000e 2318 0200 0db5 0400 242d 0000 4b17 0000 000b 0000 4ae7 0000 21cf 0000 315f
1435200  0000 0034 000e 22e4 b27c b66c 0000 0499 7fff ffff 000e 234c 0200 0db5 0400 242d 0000 4b17 0000 0013 0000 4ae7 0000 21cf
1435260  0000 315f 0000 0034 000e 2318 b27c b66c 0000 049a 7fff ffff 000e 2380 0200 0db5 0400 242d 0000 4b17 0000 001b 0000 4ae7
1435340  0000 21cf 0000 315f 0000 0034 000e 234c b27c b66c 0000 049b 7fff ffff 000e 23b4 0200 0db5 0400 242d 0000 4b1f 0000 000b
1435420  0000 4ae7 0000 21cf 0000 315f 0000 0034 000e 2380 b27c b66c 0000 049c 7fff ffff 000e 23e8 0200 0db5 0400 242d 0000 4b1f
1435500  0000 0013 0000 4ae7 0000 21cf 0000 315f 0000 0034 000e 23b4 b27c b66c 0000 049d 7fff ffff 000e 241c 0200 0db5 0400 242d
1435560  0000 4b1f 0000 001b 0000 4ae7 0000 21cf 0000 315f 0000 0034 000e 23e8 b27c b66c 0000 049e 7fff ffff 000e 4ccc 0200 0db5
1435640  0400 242d 0000 4b27 0000 0013 0000 4ae7 0000 21cf 0000 315f 000e 28c0 0000 03f4 b27c b66c 0000 049f 0000 04b7 000e 24b4
1435720  0200 0db5 0500 1cdd 0000 2def 0000 000b 0000 4ae7 0073 64c3 0000 02c3 0000 315f 000e 24b0 0000 002c b4f0 b4e4 0000 049e
1436000  7fff ffff 0008 b0dd 0000 0000 0000 000e 2718 0002 438a 000e 6f6c 000e 24e8 0000 0038 b27c b66c 0000 04a1 0000 04b8
1436060  000e 24ec 0200 0db5 0500 1cdd 0000 4b27 0000 0013 0000 4ae7 0073 6243 0000 02c3 0000 315f 000e 2520 0000 0038 b27c b66c
1436140  0000 04a2 0000 04b9 000e 2524 0200 0db5 0500 1cdd 0000 4b0f 0000 0013 0000 4ae7 0073 5a43 0000 02c3 0000 315f 000e 2558
1436220  0000 0038 b27c b66c 0000 04a3 0000 04ba 000e 255c 0200 0db5 0500 1cdd 0000 4b0f 0000 001b 0000 4ae7 0073 5b43 0000 02c3
1436300  0000 315f 000e 2590 0000 0038 b27c b66c 0000 04a4 0000 04bb 000e 2594 0200 0db5 0500 1cdd 0000 4b17 0000 000b 0000 4ae7
1436360  0073 5c43 0000 02c3 0000 315f 000e 25c8 0000 0038 b27c b66c 0000 04a5 0000 04bc 000e 25cc 0200 0db5 0500 1cdd 0000 4b17
1436440  0000 0013 0000 4ae7 0073 5d43 0000 02c3 0000 315f 000e 2600 0000 0038 b27c b66c 0000 04a6 0000 04bd 000e 2604 0200 0db5
1436520  0500 1cdd 0000 4b17 0000 001b 0000 4ae7 0073 5e43 0000 02c3 0000 315f 000e 2638 0000 0038 b27c b66c 0000 04a7 0000 04be
1436600  000e 263c 0200 0db5 0500 1cdd 0000 4b1f 0000 000b 0000 4ae7 0073 5f43 0000 02c3 0000 315f 000e 2670 0000 0038 b27c b66c
1436660  0000 04a8 0000 04bf 000e 2674 0200 0db5 0500 1cdd 0000 4b1f 0000 0013 0000 4ae7 0073 6043 0000 02c3 0000 315f 000e 26a8
```

```
1436740 0000 0038 b27c b66c 0000 04a9 0000 04c0 000e 26ac 0200 0db5 0500 1cdd 0000 4b1f 0000 001b 0000 4ae7 0073 6143 0000 02c3
1437020 0000 315f 000e 2714 0000 0038 b27c b66c 0000 04aa 0000 04c1 000e 2718 0200 0db5 0500 1cdd 0000 22df 0000 0013 0000 4ae7
1437100 0073 7443 0000 02c3 0000 315f 000e 2714 0000 0034 5d10 0000 0100 3037 4b8c 0000 0000 4b4f 5758 4af8 0000 4b3f 55f0 4af8
1437160 0000 4b47 55f0 4af8 0000 4b37 5370 228c 000e 274c 0000 0038 b130 b66c 0000 04ab 0000 04c2 000e 2499 0200 0db5 0500 1cdd
1437240 0000 22d7 0000 0013 0000 4ae7 0073 76a3 0000 02c3 0000 315f 000e 279c 0000 0050 4e1c 0000 0000 4b3f 5d7c 0000 0300 4b3f
1437320 6784 6160 5de8 0000 0100 0ab7 4b8c 0000 0000 253f 5d7c 0000 0100 0ab7 4b8c 0000 0000 253f 5d10 0000 0100 0ab7 4b8c 0000
1437400 0000 253f 228c 6420 000e 2800 0000 0064 4e1c 0000 0000 4b47 5d7c 0000 0400 4b47 64a8 6160 5e54 0000 0100 0ab7 4b8c 0000
1437460 0000 253f 5de8 0000 0100 0ab7 4b8c 0000 0000 253f 5758 6750 5370 5b58 0100 0ad7 4b8c 0000 0000 253f 5d10 0000 0100 0ab7
1437540 4b8c 0000 0000 253f 228c 6f72 000e 28c0 0000 0040 4e1c 0000 0000 4b37 5d7c 0000 0200 4b37 6160 5b58 0100 0ab7 4b8c 0000
1437620 0000 253f 56f9 671c 5370 5aec 0100 0ad7 4b8c 0000 0000 253f 228c 2049 003d 2f68 6f64 652f 6f73 6173 322f 622f 7175 696e
1437700 7475 732f 6765 6e65 7269 632f 7170 6c69 6232 2e35 2f6c 6962 7261 7279 2f73 756e 342d 342e 302f 6374 722e 6f00 003b 2f68
1437760 6f6d 652f 6f73 6173 322f 622f 7175 696e 7475 732f 6765 6e65 7269 632f 7170 6c69 6232 2e35 2f6c 6962 7261 7279 2f73 756e
1440040 342d 342f 6374 722e 6f00 2c20 000e 4c30 0000 1830 2020 6c65 7473 2079 6f75 206d 616b 6520 796f 7572 206f 776e 2076 6572
1440120 7369 6f6e 732e 2020 4966 2074 6865 206c 6973 7420 6973 205b 5320 7468 6520 556e 6974 2077 696c 6c0a 2020 2020 6265 2072
1440200 6574 7572 6e65 642c 2074 6861 7420 6973 2074 6865 206f 6e6c 7920 7573 6520 6f66 2074 6865 2055 6e69 742e 0a09 6c69 7374
1440260 5f74 6f5f 6269 6e61 7279 284c 6973 742c 204f 7065 7261 746f 722c 2054 7265 6529 0a20 2020 2073 686f 756c 6420 6265 2075
1440340 7365 6420 7768 656e 2074 6865 204f 7065 7261 746f 7220 6861 7320 6e6f 2055 6e69 742c 2069 6620 6769 7665 6e20 616e 2065
1440420 6470 7479 0a20 2020 206c 6973 7420 6974 2077 696c 6c20 6661 696c 2e20 2059 6f75 206d 6179 2066 696e 6420 6974 206d 6f72
1440500 6520 7573 6566 756c 2074 6f20 6361 6c6c 2074 6865 0a20 2020 2061 7578 696c 6961 7279 2072 6f75 7469 6e65 7320 6c69 7374
1440560 5f74 6f5f 6269 6e61 7279 4c20 616e 6420 6c69 7374 5f74 6f5f 6269 6e61 7279 5220 6469 7265 6374 6c79 2e0a 0a20 2020 204e
1440640 6f74 653a 2061 2067 6f6f 6420 5072 6f6c 6f67 2070 726f 6772 616d 6d65 7220 7368 6f75 6c64 2062 6520 7261 7468 6572 2070
1440720 757a 7a6c 6564 2062 7920 7468 650a 2020 2020 7761 7920 736f 6d65 206f 6620 7468 6573 6520 7072 6564 6963 6174 6573 2061
1441000 7265 2063 6f64 6564 2e20 2057 6879 2068 6176 656e 2774 2049 2075 7365 203d 2e2e 203f 0a20 2020 2054 6865 2063 616c 6c73
1441060 2074 6f20 6675 6e63 746f 7220 2620 6172 6720 776f 756c 6420 6265 206d 7563 6820 636c 6561 7265 7220 6173 2075 6e69 7673
1441140 2e20 2054 6865 0a20 2020 2073 7570 6572 6220 5072 6f6c 6f67 2070 726f 6772 616d 6d65 7220 7769 6c6c 2074 616b 6520 7468
1441220 6520 7472 6f75 626c 6520 746f 206d 6561 7375 7265 2068 6f77 0a20 2020 2066 6173 7420 5820 3d2e 2e20 5b46 2c41 2c42 5d20
1441300 6973 2c20 636f 6170 6172 6564 2077 6974 6820 6578 706c 6963 6974 2063 616c 6c73 2074 6f20 6675 6e63 746f 7220 260a 2020
1441360 2020 6172 672c 2061 6e64 2077 696c 6c20 6669 6e64 2074 6861 7420 7468 6520 6578 706c 6963 6974 2063 616c 6c73 2061 7265
1441440 2071 7569 7465 2061 2062 6974 2066 6173 7465 722e 0a2a 2f0a 0a3a 2d20 6d6f 6475 6c65 2866 6c61 7474 656e 2c20 5b0a 0961
1441520 6e64 5f74 6f5f 6c69 7374 2f32 2c09 0925 2020 636f 6e6a 756e 6374 696f 6e20 2d3e 206c 6973 7420 6f66 2063 6f6e 6a75 6e63
1441600 7473 0a09 6c69 7374 5f74 6f5f 616e 642f 322c 0909 2520 206c 6973 7420 6f66 2063 6f6e 6a75 6e63 7473 202d 3e20 636f 6e6a
1441660 756e 6374 696f 6e0a 0a09 6f72 5f74 6f5f 6c69 7374 2f32 2c09 0925 2020 6469 736a 756e 6374 696f 6e20 2d3e 206c 6973 7420
1441740 6f66 2064 6973 6a75 6e63 7473 0a09 6c69 7374 5f74 6f5f 6f72 2f32 2c09 0925 2020 6c69 7374 206f 6620 6469 736a 756e 6374
1442020 7320 2d3e 2064 6973 6a75 6e63 7469 6f6e 0a0a 0970 6c75 735f 746f 5f6c 6973 742f 322c 0909 2520 2073 756d 202d 3e20 6c69
1442100 7374 206f 6620 7465 726d 730a 096c 6973 745f 746f 5f70 6c75 732f 322c 0909 2520 206c 6973 7420 6f66 2074 6572 6d73 202d
1442160 3e20 7375 6d0a 0a09 7469 6d65 735f 746f 5f6c 6973 742f 322c 0925 2020 7072 6f64 7563 7420 2d3e 206c 6973 7420 6f66 2066
1442240 6163 746f 7273 0a09 6c69 7374 5f74 6f5f 7469 6d65 732f 322c 0925 2020 6c69 7374 206f 6620 6661 6374 6f72 7320 2d3e 2070
1442320 726f 6475 6374 0a0a 0966 6c61 7474 656e 2f32 2c09 0925 2020 6c69 7374 206f 6620 6c69 7374 7320 2d3e 206c 6973 740a 0a09
1442400 6269 6e61 7279 5f74 6f5f 6c69 7374 2f34 2c09 2520 2054 6572 6d2c 4f70 6572 6174 6f72 202d 3e20 4469 6666 6572 656e 6365
1442460 4c69 7374 0a09 6269 6e61 7279 5f74 6f5f 6c69 7374 2f35 2c09 2520 2054 6572 6d2c 4f70 6572 6174 6f72 2c55 6e69 7420 2d3e
1442540 2044 6966 6665 7265 6e63 654c 6973 742a 0a09 6c69 7374 5f74 6f5f 6269 6e61 7279 2f33 2c09 2520 204c 6973 742c 4f70 6572
1442620 6174 6f72 202d 3e20 5465 726d 0a09 6c69 7374 5f74 6f5f 6269 6e61 7279 2f34 0925 2020 4c69 7374 2c4f 7065 7261 746f 722c
1442700 556e 6974 202d 3e20 5465 726d 0a20 2020 5d29 2e0a 0a3a 2d20 6d6f 6465 0a09 616e 645f 746f 5f6c 6973 7428 2b2c 202d 292c
1442760 0a09 6269 6e61 7279 5f74 6f5f 6c69 7374 282b 2c20 2b2c 202d 2c20 3f29 2c0a 0962 696e 6172 795f 746f 5f6c 6973 7428 2b2c
1443040 202b 2c20 2b2c 202d 2c20 3f29 2c0a 0966 6c61 7474 656e 282b 2c20 3f29 2c0a 0920 2020 2066 6c61 7474 656e 282b 2c20 3f2c
1443120 203f 292c 0a09 6c69 7374 5f74 6f5f 616e 6428 2b2c 202d 292c 0a09 6c69 7374 5f74 6f5f 6269 6e61 7279 282b 2c20 2b2c 202d
1443200 292c 0a09 6c69 7374 5f74 6f5f 6269 6e61 7279 282b 2c20 2b2c 202b 2c20 2d29 2c0a 096c 6973 745f 746f 5f62 696e 6172 794c
1443260 282b 2c20 2b2c 202b 2c20 2d29 2c0a 096c 6973 745f 746f 5f62 696e 6172 7952 282b 2c20 2b2c 202b 2c20 2d29 2c0a 096c 6973
1443340 745f 746f 5f6f 7228 2b2c 2021 292c 0a09 6c69 7374 5f74 6f5f 706c 7573 282b 2c20 2d29 2c0a 096c 6973 745f 746f 5f74 696d
1443420 6573 282b 2c20 2129 2c0a 096f 725f 746f 5f6c 6973 7428 2b2c 202d 292c 0a09 706c 7573 5f74 6f5f 6c69 7374 282b 2c20 2d29
1443500 2c0a 0974 696d 6573 5f74 6f5f 6c69 7374 282b 2c20 2d29 2e0a 0a73 6363 735f 6964 2827 2240 2823 2938 392f 3036 2f30 3120
1443560 666c 6174 7465 6e2e 706c 0933 322e 3122 2729 2e0a 0a0a 0a61 6e64 5f74 6f5f 6c69 7374 2843 6f6e 6a75 6e63 7469 6f6e 2c20
1443640 4c69 7374 2920 3a2d 0a09 6269 6e61 7279 5f74 6f5f 6c69 7374 2843 6f6e 6a75 6e63 7469 6f6e 2c20 262c 2074 7275 652c 204c
1443720 6973 742c 205b 5d29 2e0a 0a0a 6c69 7374 5f74 6f5f 616e 6428 4c69 7374 2c20 436f 6e6a 756e 6374 696f 6e29 203a 2d0a 096c
1444000 6973 745f 746f 5f62 696e 6172 7928 4c69 7374 2c20 262c 2074 7275 652c 2043 6f6e 6a75 6e63 7469 6f6e 292e 0a0a 0a0a 6f72
```

```
1444060  5f74 6f5f 6c69 7374 2844 6973 6a75 6e63 7469 6f6e 2c20 4c69 7374 2920 3a2d 0a09 6269 6e61 7279 5f74 6f5f 6c69 7374 2844
1444140  6973 6a75 6e63 7469 6f6e 3b2c 2066 616c 7365 2c20 4c69 7374 2c20 5b5d 292e 0a0a 0a6c 6973 745f 746f 5f6f 7228 4c69
1444220  7374 2c20 4469 736a 756e 6374 696f 6e29 203a 2d0a 096c 6973 745f 746f 5f62 696e 6172 7928 4c69 7374 2c20 3b2c 2066 616c
1444300  7365 2c20 4469 736a 756e 6374 696f 6e29 2e0a 0a0a 0a70 6c75 735f 746f 5f6c 6973 7428 5375 6d2c 204c 6973 7429 203a 2d0a
1444360  0962 696e 6172 795f 746f 5f6c 6973 7428 5375 612c 202b 2c20 302c 204c 6973 742c 205b 5d29 2e0a 0a0a 6c69 7374 5f74 6f5f
1444440  706c 7573 284c 6973 742c 2053 756d 2920 3a2d 0a09 6c69 7374 5f74 6f5f 6269 6e61 7279 284c 6973 742c 202b 2c20 302c 2053
1444520  756d 292e 0a0a 0a0a 7469 6d65 735f 746f 5f6c 6973 7428 5072 6f64 7563 742c 204c 6973 7429 203a 2d0a 0962 696e 6172 795f
1444600  746f 5f6c 6973 7428 5072 6f64 7563 742c 202a 2c20 312c 204c 6973 742c 205b 5d29 2e0a 0a0a 6c69 7374 5f74 6f5f 7469 6d65
1444660  7328 4c69 7374 2c20 5072 6f64 7563 7429 203a 2d0a 096c 6973 745f 746f 5f62 696e 6172 7928 4c69 7374 2c20 2a2c 2031 2c20
1444740  5072 6f64 7563 7429 2e0a 0a0a 0a25 2020 2066 6c61 7474 656e 2854 7265 652c 204c 6973 7429 0a25 2020 2066 6c61 7474 656e
1445020  7320 6120 5472 6565 206f 6620 636f 6e73 2063 656c 6c73 2c20 7969 656c 6469 6e67 2061 204c 6973 742e 2020 5468 6973 2069
1445100  7320 6a75 7374 0a25 0962 696e 6172 795f 746f 5f6c 6973 7428 5472 6565 2c20 2e2c 205b 5d2c 204c 6973 742c 205b 5d29 2e0a
1445160  2520 2020 6275 7420 6974 2069 7320 6d6f 7265 2065 6666 6963 6965 6e74 2e20 2059 6f75 206d 6179 2066 696e 6420 6974 2068
1445240  656c 7066 756c 2074 6f20 7365 6520 7468 650a 2520 2020 7370 6563 6961 6c20 6361 7365 2061 7320 6120 6775 6964 6520 746f
1445320  2074 6865 2067 656e 6572 616c 2063 6173 652e 0a09 0a66 6c61 7474 656e 2854 7265 652c 204c 6973 7429 203a 2d0a 0966 6c61
1445400  7474 656e 2854 7265 652c 204c 6973 742c 205b 5d29 2e0a 0a66 6c61 7474 656e 285b 5d29 202d 2d3e 2021 2e0a 666c 6174 7465
1445460  6e28 5b48 6561 647c 5461 696c 5d29 202d 2d3e 2021 2c0a 0966 6c61 7474 656e 2848 6561 6429 2c0a 0966 6c61 7474 656e 2854
1445540  6169 6c29 2e0a 666c 6174 7465 6e28 4f74 6865 7229 202d 2d3e 0a20 2020 2025 097b 204f 7468 6572 207e 3d20 5b5d 2c20 4f74
1445620  6865 7220 7e3d 205b 5f7c 5f5d 207d 2c0a 095b 4f74 6865 725d 2e0a 0a0a 0a62 696e 6172 795f 746f 5f6c 6973 7428 556e 6974
1445700  2c20 5f2c 2055 6e69 7429 202d 2d3e 2021 2e0a 6269 6e61 7279 5f74 6f5f 6c69 7374 284e 6f64 652c 204f 7065 7261 746f 722c
1445760  2055 6e69 7429 202d 2d3e 0a09 7b20 4e6f 6465 203d 2e2e 205b 4f70 6572 6174 6f72 2c4c 6873 2c52 6873 5d20 7d2c 2025 204e
1446040  6f64 6520 6361 6e27 7420 6265 2061 2076 6172 6961 626c 650a 0921 2c0a 0962 696e 6172 795f 746f 5f6c 6973 7428 4c68 732c
1446120  204f 7065 7261 746f 722c 2055 6e69 7429 2c0a 0962 696e 6172 795f 746f 5f6c 6973 7428 5268 732c 204f 7065 7261 746f 722c
1446200  2055 6e69 7429 2e0a 6269 6e61 7279 5f74 6f5f 6c69 7374 284f 7468 6572 2c20 5f2c 205f 2920 2d2d 3e0a 2020 2020 2509 7b20
1446260  4f74 6865 7220 7e3d 2055 6e69 742c 204f 7468 6572 207e 3d2e 2e20 5b4f 7065 7261 746f 722c 5f2c 5f5d 207d 2c0a 095b 4f74
1446340  6865 725d 2e0a 0a0a 6269 6e61 7279 5f74 6f5f 6c69 7374 284e 6f64 652c 204f 7065 7261 746f 7229 202d 2d3e 0a09 7b20 6e6f
1446420  6e76 6172 284e 6f64 6529 207d 2c0a 097b 204e 6f64 6520 3d2e 2e20 5b4f 7065 7261 746f 722c 4c68 732c 5268 735d 207d 2c0a
1446500  0921 2c0a 0962 696e 6172 795f 746f 5f6c 6973 7428 4c68 732c 204f 7065 7261 746f 7229 2c0a 0962 696e 6172 795f 746f 5f6c
1446560  6973 7428 5268 732c 204f 7065 7261 746f 7229 2e0a 6269 6e61 7279 5f74 6f5f 6c69 7374 284f 7468 6572 2c20 5f29 202d 2d3e
1446640  0a20 2020 2025 097b 204f 7468 6572 207e 3d2e 2e20 5b4f 7065 7261 746f 722c 5f2c 5f5d 207d 2c0a 095b 4f74 6865 725d 2e0a
1446720  0a0a 0a6c 6973 745f 746f 5f62 696e 6172 7928 5b5d 2c20 5f2c 2055 6e69 742c 2055 6e69 7429 2e0a 6c69 7374 5f74 6f5f 6269
1447000  6e61 7279 285b 4865 6164 7c54 6169 6c5d 2c20 4f70 6572 6174 6f72 2c20 5f2c 2041 6e73 7765 7229 203a 2d0a 0963 7572 7265
1447060  6e74 5f6f 7028 5f2c 2079 6678 2c20 4f70 6572 6174 6f72 292c 0a09 212c 0a09 6c69 7374 5f74 6f5f 6269 6e61 7279 4c28 5461
1447140  696c 2c20 4f70 6572 6174 6f72 2c20 4865 6164 2c20 416e 7377 6572 292e 0a6c 6973 745f 746f 5f62 696e 6172 7928 5b48 6561
1447220  647c 5461 696c 5d2c 204f 7065 7261 746f 722c 205f 2c20 416e 7377 6572 2920 3a2d 0a09 6c69 7374 5f74 6f5f 6269 6e61 7279
1447300  5228 5461 696c 2c20 4865 6164 2c20 4f70 6572 6174 6f72 2c20 416e 7377 6572 292e 0a0a 0a6c 6973 745f 746f 5f62 696e 6172
1447360  7928 5b48 6561 647c 5461 696c 5d2c 204f 7065 7261 746f 722c 2041 6e73 7765 7229 203a 2d0a 0963 7572 7265 6e74 5f6f 7028
1447440  5f2c 2079 6678 2c20 4f70 6572 6174 6f72 292c 0a09 212c 0a09 6c69 7374 5f74 6f5f 6269 6e61 7279 4c28 5461 696c 2c20 4f70
1447520  6572 6174 6f72 2c20 4865 6164 2c20 416e 7377 6572 292e 0a6c 6973 745f 746f 5f62 696e 6172 7928 5b48 6561 647c 5461 696c
1447600  5d2c 204f 7065 7261 746f 722c 2041 6e73 7765 7229 203a 2d0a 096c 6973 745f 746f 5f62 696e 6172 7952 2854 6169 6c2c 2048
1447660  6561 642c 204f 7065 7261 746f 722c 2041 6e73 7765 7229 2e0a 0a0a 6c69 7374 5f74 6f5f 6269 6e61 7279 4c28 5b5d 2c20 5f2c
1447740  2054 6572 6d2c 2054 6572 6d29 2e0a 6c69 7374 5f74 6f5f 6269 6e61 7279 4c28 5b48 6561 647c 5461 696c 5d2c 204f 7065 7261
1450020  746f 722c 2054 6572 6d30 2c20 5465 726d 2920 3a2d 0a09 5465 726d 3120 3d2e 2e20 5b4f 7065 7261 746f 722c 5465 726d 302c
1450100  4865 6164 5d2c 0a09 6c69 7374 5f74 6f5f 6269 6e61 7279 4c28 5461 696c 2c20 4f70 6572 6174 6f72 2c20 5465 726d 312c 2054
1450160  6572 6d29 2e0a 0a0a 6c69 7374 5f74 6f5f 6269 6e61 7279 5228 5b5d 2c20 5465 726d 2c20 5f2c 2054 6572 6d29 2e0a 6c69 7374
1450240  5f74 6f5f 6269 6e61 7279 5228 5b48 6561 647c 5461 696c 5d2c 2054 6572 6d30 2c20 4f70 6572 6174 6f72 2c20 5465 726d 2920
1450320  3a2d 0a09 5465 726d 203d 2e2e 205b 4f70 6572 6174 6f72 2c54 6572 6d30 2c54 6572 6d31 5d2c 0a09 6c69 7374 5f74 6f5f 6269
1450400  6e61 7279 5228 5461 696c 2c20 4865 6164 2c20 4f70 6572 6174 6f72 2c20 5465 726d 3129 2e0a 0a0a 0ab1 000d ff79 000d ff09
1450460  000e 39c6 000d ff49 000e 39ea 0600 32df 0000 0103 0000 3077 0000 0023 000d bb11 000d ff35 000d fffd 000d ff8d 000e 39f2
1450540  000d ffcd 000e 3a16 0600 32df 0000 010b 0000 3077 0000 0013 000d ba81 000d ffb9 000e 0081 000e 0011 000e 3a1e 000e 0051
1450620  000e 3a42 0600 32df 0000 0113 0000 3077 0000 0023 000d b9f1 000e 003d 000e 0105 000e 0095 000e 3a4a 000e 00d5 000e 3a6e
1450700  0600 32df 0000 011b 0000 3077 0000 0013 000d b961 000e 00c1 000e 0189 000e 0119 000e 3a76 000e 0159 000e 3a9a 0600 32df
1450760  0000 0123 0000 3077 0000 0023 000d b8d1 000e 0145 000e 020d 000e 019d 000e 3aa2 000e 01dd 000e 3ac6 0600 32df 0000 012b
1451040  0000 3077 0000 0013 000d b841 000e 01c9 000e 0291 000e 0221 000e 3ace 000e 0261 000e 3af2 0600 32df 0000 0133 0000 3077
1451120  0000 0023 000d b7b1 000e 024d 000e 0315 000e 02a5 000e 3afa 000e 02e5 000e 3b1e 0600 32df 0000 013b 0000 3077 0000 0013
```

```
1451200 000d b721 000e 02d1 000e 0399 000e 0329 000e 3b26 000e 0369 000e 3b4a 0600 32df 0000 0143 0000 3077 0000 0023 000d b691
1451260 000e 0355 000e 041d 000e 03ad 000e 3b52 000e 03ed 000e 3b76 0600 32df 0000 014b 0000 3077 0000 0013 000d b601 000e 03d9
1451340 000e 04a1 000e 0431 000e 3b7e 000e 0471 000e 3ba2 0600 32df 0000 0153 0000 3077 0000 0023 000d b571 000e 045d 000e 0525
1451420 000e 04b5 000e 3baa 000e 04f5 000e 3bce 0600 32df 0000 015b 0000 3077 0000 0013 000d b4e1 000e 04e1 000e 05a9 000e 0539
1451500 000e 3bd6 000e 0579 000e 3bfa 0600 32df 0000 0163 0000 3077 0000 0023 000d b451 000e 0565 000e 062d 000e 05bd 000e 3c02
1451560 000e 05fd 000e 3c26 0600 32df 0000 016b 0000 3077 0000 0013 000d b3c1 000e 05e9 000e 06b1 000e 0641 000e 3c2e 000e 0681
1451640 000e 3c52 0600 32df 0000 0173 0000 3077 0000 0023 000d b331 000e 066d 000e 0735 000e 06c5 000e 3c5a 000e 0705 000e 3c7e
1451720 0600 32df 0000 017b 0000 3077 0000 0013 000d b2a1 000e 06f1 000e 07b9 000e 0749 000e 3c86 000e 0789 000e 3caa 0600 32df
1452000 0000 0183 0000 3077 0000 0023 000d b211 000e 0775 000e 083d 000e 07cd 000e 3cb2 000e 080d 000e 3cd6 0600 32df 0000 018b
1452060 0000 3077 0000 0013 000d b181 000e 07f9 000e 08c1 000e 0851 000e 3cde 000e 0891 000e 3d02 0600 32df 0000 0193 0000 3077
1452140 0000 0023 000d b0f1 000e 087d 000e 0945 000e 08d5 000e 3d0a 000e 0915 000e 3d2e 0600 32df 0000 019b 0000 3077 0000 0013
1452220 000d b061 000e 0901 000e 09c9 000e 0959 000e 3136 000e 0999 000e 3d5a 0600 32df 0000 01a3 0000 3077 0000 0023 000d afd1
1452300 000e 0985 000e 0a4d 000e 09dd 000e 3d62 000e 0a1d 000e 3d86 0600 32df 0000 01ab 0000 3077 0000 0013 000d af41 000e 0a09
1452360 000e 0ad1 000e 0a61 000e 3d8e 000e 0aa1 000e 3db2 0600 32df 0000 01b3 0000 3077 0000 0023 000d aeb1 000e 0a8d 000e 0b55
1452440 000e 0ae5 000e 3dba 000e 0b25 000e 3dde 0600 32df 0000 01bb 0000 3077 0000 0013 000d ae21 000e 0b11 000e 0bd9 000e 0b69
1452520 000e 3de6 000e 0ba9 000e 3e0a 0600 32df 0000 01c3 0000 3077 0000 0023 000d ad91 000e 0b95 000e 0c5d 000e 0bed 000e 3e12
1452600 000e 0c2d 000e 3e36 0600 32df 0000 01cb 0000 3077 0000 0013 000d ad01 000e 0c19 000e 0ce1 000e 0c71 000e 3e3e 000e 0cb1
1452660 000e 3e62 0600 32df 0000 01d3 0000 3077 0000 0023 000d ac71 000e 0c9d 000e 0d65 000e 0cf5 000e 3e6a 000e 0d35 000e 3e8e
1452740 0600 32df 0000 01db 0000 3077 0000 0013 000d abe1 000e 0d21 000e 0de9 000e 0d79 000e 3e96 000e 0db9 000e 3eba 0600 32df
1453020 0000 01e3 0000 3077 0000 0023 000d ab51 000e 0da5 000e 0e6d 000e 0dfd 000e 3ec2 000e 0e3d 000e 3ee6 0600 32df 0000 01eb
1453100 0000 3077 0000 0013 000d aac1 000e 0e29 000e 0ef1 000e 0e81 000e 3eee 000e 0ec1 000e 3f12 0600 32df 0000 01f3 0000 3077
1453160 0000 0023 000d aa31 000e 0ead 000e 0f75 000e 0f05 000e 3f1a 000e 0f45 000e 3f3e 0600 32df 0000 01fb 0000 3077 0000 0013
1453240 000d a9a1 000e 0f31 000e 0ff9 000e 0f89 000e 3f46 000e 0fc9 000e 3f6a 0600 32df 0000 0203 0000 3077 0000 0023 000d a911
1453320 000e 0fb5 000e 10a5 000e 100d 000e 3f72 000e 106d 000e 3f96 0600 32df 0000 020b 0000 3077 0000 0013 000d a881 000e 1079
1453400 000e 1129 000e 10b9 000e 3f9e 000e 10f9 000e 3fc2 0600 32df 0000 0213 0000 3077 0000 0023 000d a7f1 000e 10e5 000e 11ad
1453460 000e 113d 000e 3fca 000e 117d 000e 3fee 0600 32df 0000 021b 0000 3077 0000 0013 000d a761 000e 1169 000e 1231 000e 11c1
1453540 000e 3ff6 000e 1201 000e 401a 0600 32df 0000 0223 0000 3077 0000 0023 000d a6d1 000e 11ed 000e 12b5 000e 1245 000e 4022
1453620 000e 1285 000e 4046 0600 32df 0000 022b 0000 3077 0000 0013 000d a641 000e 1271 000e 1339 000e 12c9 000e 404e 000e 1309
1453700 000e 4072 0600 32df 0000 0233 0000 3077 0000 0023 000d a5b1 000e 12f5 000e 13bd 000e 134d 000e 407a 000e 138d 000e 409e
1453760 0600 32df 0000 023b 0000 3077 0000 0013 000d a521 000e 1379 000e 1441 000e 13d1 000e 40a6 000e 1411 000e 40ca 0600 32df
1454040 0000 0243 0000 3077 0000 0023 000d a491 000e 13fd 000e 14c5 000e 1455 000e 40d2 000e 1495 000e 40f6 0600 32df 0000 024b
1454120 0000 3077 0000 0013 000d a401 0005 6675 6e69 7400 000b 6750 0200 4a6f 0000 4a47 0000 0008 000e 4480 000e 4480 0001 0057
1454200 0000 0000 0010 dc00 0000 0000 0010 dcf0 000e 4114 000c 056c 0200 4a77 0000 4a47 0000 0008 000e 44c4 000e 44c4 0001 0057
1454260 0000 0000 0000 4a77 b328 1651 000d da4c 0000 0000 000e 4144 000b 67b0 000b 67c0 0200 4a7f 0000 4a47 0000 0008 000e 44f4
1454340 000e 44f4 0001 0057 0000 0000 0000 4a7f b328 16a5 000d da80 0000 0000 0010 dd70 000e 4264 0010 db90 0000 0000 ffff ffff
1454420 0200 4a87 0000 4a47 0000 0008 000e 4548 000e 4548 0001 0057 0000 0000 0000 4a87 b328 0023 000d dab4 0000 0000 ffff ffff
1454500 0200 4a8f 0000 4a47 0000 0008 000e 4568 000e 4568 0001 0057 0000 0000 0000 4a8f b328 a0a1 000d dae8 0000 0000 ffff ffff
1454560 0200 4a97 0000 4a47 0000 0008 000e 459c 000e 459c 0001 0057 0000 0000 0000 4a97 b328 181d 000d db1c 0000 0000 000b ae44
1454640 0200 4a9f 0000 4a47 0000 0008 000e 45cc 000e 45cc 0001 0057 0000 0000 0000 4a9f b328 1969 000d db50 0000 0000 0010 dbe0
1454720 0000 0000 0010 dae0 0000 0000 ffff ffff 0200 4aa7 0000 4a47 0000 0008 000e 4528 000e 4528 0001 0057 0000 0000 0000 4aa7
1455000 b328 32df 000d db84 0000 0000 ffff ffff 0200 4a47 0000 4a47 0000 0008 000e 4610 000e 4610 0001 0057 0000 0000 0000 4a47
1455060 b328 02a3 000d dbb8 0000 0000 000b de04 0400 4aaf 0000 4a47 0000 0010 000d e06c 000e 46ec 0001 0057 0000 0000 0000 4aaf
1455140 b464 3077 000d dbec 000e 1fc8 0010 dc50 000e 4478 0011 b850 0010 6240 000e 42cc 0500 4aaf 0000 4a47 0000 0014 000e 46c4
1455220 000e 46d8 0001 0057 0000 0000 ffff ffff 0300 4ab7 0000 4a47 0000 000c 000e 47a8 000e 47a8 0001 0057 0000 0000 0000 4ab7
1455300 b464 9c21 000d dc54 000e 1fbc 000e 432c 0400 4ab7 0000 4a47 0000 0010 000e 4724 000e 4724 0001 0057 0000 0000 001e 2240
1455360 2823 2938 392f 3336 2f30 3120 666c 6174 7465 6e2e 706c 0933 322e 3122 0000 02cb 000e 2010 0100 2def 0000 4a47 0000 0004
1455440 000e 442c 000e 442c 0001 0057 0000 0000 000a 6672 656d 6169 6e64 6572 0000 0000 0000 0028 000e 2038 b27c b66c 0000 0468
1455520 7fff ffff 000e 6cb0 0200 0db5 0100 32b5 0000 4a47 0000 315f 0000 4a47 b328 0013 000e 43dc 0000 0000 0005 5150 5f4c 3600
1455600 0005 5245 4731 3600 2c78 0012 0002 438a 4e1c 0000 0000 4acf 228c 0023 2cac 9951 0002 438a 2ca0 1f15 0000 0000 0000 0001
1455660 000e 4418 000e 4418 0002 438a 000e 4450 000e 4424 0001 2600 0000 4b97 b328 0000 000e 4c0c 0000 0000 0005 6761 6d6d 6100
1455740 0011 b594 0000 0000 0010 db58 0000 0000 2c78 0024 0002 438a 36a4 43a4 0018 41fc 0000 315f 4254 0000 0000 4ad7 239c 0000
1456020 000e 431c 2c78 0010 0002 438a 239c 0000 000e 6d10 0000 4ba7 b328 4479 000e 4d38 0000 0000 2c78 0020 0002 438a 36a4 41fc
1456100 0000 315f 4254 0000 0000 4ad7 239c 0000 000e 436c 0000 4b9f b328 20b5 000e 4cd0 0000 0000 2c78 0024 0002 438a 36a4 43a4
1456160 0018 41fc 0000 222f 4254 0000 0000 0ddf 239c 0000 000e 431c 0000 4ae7 b328 2179 000e 6cb4 0000 0000 2c78 0020 0002 438a
1456240 36a4 41fc 0000 000b 4254 0000 0000 0a87 239c 0000 000e 436c 2c78 0020 0002 438a 36a4 41fc 0000 222f 4254 0000 0000 0ddf
```

```
1456320  239c 0000 000e 436c 2c78 0024 0002 438a 36a4 43a4 0018 41fc 0000 0003 4254 0000 0000 0ab7 239c 0000 000e 431c 0000 4b27
1456400  b328 226d 000e 2420 0000 0000 2c78 0020 0002 438a 36a4 41fc 0000 0003 4254 0000 0000 0ab7 239c 0000 000e 436c 0000 4b1f
1456460  b464 23b9 000e 2384 000d 8290 2c78 0024 0002 438a 36a4 43a4 0018 41fc 0000 000b 4254 0000 0000 0a97 239c 0000 000e 431c
1456540  0000 4b17 b464 45fa 000e 22e8 000d 8284 2c78 0010 0002 438a 239c 0000 000e 6b48 2c78 0010 0002 438a 437c 22bc 000e 4630
1456620  000e 429c 0300 4a47 0000 4a47 0000 000c 000e 4658 000e 46a4 0001 0057 0000 0000 2938 0018 000e 467c 4e1c 0000 0000 0007
1456700  3574 3050 48c0 7220 27f0 32df 000e 46a4 2ca0 3077 0000 0000 0000 0001 000e 4640 000e 46a4 000e 4686 000e 1ad0 28c4 0028
1456760  000e 46a4 56f8 671c 682c 4768 3050 33bc 2410 0000 000e 4630 0018 386c 3d30 2340 000e 4630 2954 0010 0002 438a 5758 6b48
1457040  6bc8 7220 0000 4b0f b464 3077 000e 2280 000d 7c24 27f0 0014 000d dfbc 4950 359c 3050 48e0 0018 7220 2954 0014 0002 438a
1457120  3600 5758 6b48 6c48 0018 7220 2954 0012 0002 438a 35ec 5758 6b48 6c08 7220 4702 0000 4ae7 b328 4726 000e 2254 0000 0000
1457200  27f0 0014 000d e110 4e1c 0000 0000 0007 49c8 228c 2cac 2769 0002 438a 2ca0 27a9 0000 0000 0000 0001 000e 4710 000e 476c
1457260  000d 8428 000e 4748 000e 471c 0008 ac4c 0400 4abf 0000 4a47 0000 0010 000e 4810 000e 4810 0001 0057 0000 0000 2954 001c
1457340  0002 438a 56f8 6580 0018 3640 3614 0018 239c 0000 000e 4798 ffff ffff 0400 4ac7 0000 4a47 0000 0010 000e 4864 000e 4864
1457420  0001 0057 0000 0000 2cac 28f5 0002 438a 2ca0 2935 0000 0000 0000 0000 000d e178 000e 47d0 000d 82d8 000e 47cc 0000 0000
1457500  2954 001c 0002 438a 56f8 6580 0018 36b8 3640 3614 0018 22bc 000e 4798 0000 4b07 b328 0023 000e 21bc 0000 0000 27f0 0014
1457560  000d e1e0 4e1c 0000 0000 0007 49c8 228c 2cac 2ac1 0002 438a 2ca0 2b05 0000 0000 0000 0001 000e 47fc 000d e1e0 000d e1ea
1457640  000e 4834 000e 4808 000a 666c 6174 7465 6e2e 706c 0000 0000 0003 6374 7200 0000 27f0 0014 000d e268 4e1c 0000 0000 0007
1457720  49b8 228c 2cac 2c25 0002 438a 2ca0 4872 0000 0000 0000 0001 000e 4850 000d e268 000d e272 000e 4888 000e 485c 0000 0028
1460000  000e 6cb0 b27c b56c 0000 0501 7fff ffff 000f 86cc 0200 0db5 0100 32b5 0000 4b77 0000 315f 0015 85dc 0004 636f 6e64 0000
1460060  000e 40f4 0200 4a6f 0000 3287 0000 0008 000e 48e0 000e 48e0 0041 0000 0000 0000 2c78 0010 0002 438a 239c 0000 000e 4104
1460140  000e 4124 0200 4a77 0000 3287 0000 0008 000e 4910 000e 4910 0041 0000 0000 0000 2c78 0010 0002 438a 239c 0000 000e 4134
1460220  000e 415c 0200 4a7f 0000 3287 0000 0008 000e 4940 000e 4940 0041 0000 0000 0000 2c78 0010 0002 438a 239c 0000 000e 416c
1460300  000e 419c 0200 4a87 0000 3287 0000 0008 000e 4970 000e 4970 0041 0000 0000 0000 2c78 0010 0002 438a 239c 0000 000e 41ac
1460360  000e 41cc 0200 4a8f 0000 3287 0000 0008 000e 49a0 000e 49a0 0041 0000 0000 0000 2c78 0010 0002 438a 239c 0000 000e 41dc
1460440  000e 41fc 0200 4a97 0000 3287 0000 0008 000e 49d0 000e 49d0 0041 0000 0000 0000 2c78 0010 0002 438a 239c 0000 000e 420c
1460520  000e 422c 0200 4a9f 0000 3287 0000 0008 000e 4a00 000e 4a00 0041 0000 0000 0000 2c78 0010 0002 438a 239c 0000 000e 423c
1460600  000e 426c 0200 4aa7 0000 3287 0000 0008 000e 4a30 000e 4a30 0041 0000 0000 0000 2c78 0010 0002 438a 239c 0000 000e 427c
1460660  000e 4620 0200 4a47 0000 3287 0000 0008 000e 4a60 000e 4a60 0041 0000 0000 0000 2c78 0010 0002 438a 239c 0000 000e 42ac
1460740  000e 430c 0400 4aaf 0000 3287 0000 0010 000e 4a90 000e 4a90 0041 0000 0000 0000 2c78 0010 0002 438a 239c 0000 000e 42dc
1461020  000e 4a70 0500 4aaf 0000 3287 0000 0014 000e 4ac0 000e 4ac0 0041 0000 0000 0000 2c78 0010 0002 438a 239c 0000 000e 431c
1461100  000e 435c 0300 4ab7 0000 3287 0000 000c 000e 4af0 000e 4af0 0041 0000 0000 0000 2c78 0010 0002 438a 239c 0000 000e 433c
1461160  000e 4ad0 0400 4ab7 0000 3287 0000 0010 000e 4b20 000e 4b20 0041 0000 0000 0000 2c78 0010 0002 438a 239c 0000 000e 436c
1461240  0028 2f68 6f6d 652f 6f73 6173 322f 622f 7175 696e 7475 732f 7077 312e 312f 6c69 6272 6172 792f 6d61 7468 005f 002b 2f68
1461320  6f6d 652f 6f73 6173 322f 622f 7175 696e 7475 732f 7077 312e 312f 6c69 6272 6172 792f 6d61 7468 2e70 6c00 2022 0033 2f68
1461400  6f6d 652f 6f73 6173 322f 622f 7175 696e 7475 732f 6765 6e65 7269 632f 7170 6c69 6232 2e35 2f6c 6962 7261 7279 2f6d 6174
1461460  6800 436f 0036 2f68 6f6d 652f 6f73 6173 322f 622f 7175 696e 7475 732f 6765 6e65 7269 632f 7170 6c69 6232 2e35 2f6c 6962
1461540  7261 7279 2f6d 6174 682e 706c 002c 205b 0000 002c 000c f268 b27c b66c 0000 04c6 7fff ffff 000e 21b8 0200 0db5 0200 2f35
1461620  0000 4b97 0000 02cb 0000 315f 000e 578c 0000 006c b27c b66c 0000 04c7 0000 0549 000a d0ac 0200 0db5 0500 26f5 0000 1fc7
1461700  0000 26ef 0000 02cb 0200 09cd 0000 02c3 0000 0023 0000 3a2f 0000 315f 000e 578c 0000 002c b27c b66c 0000 04c8 0000 054a
1461760  000a d16d 0200 0db5 0200 270d 0000 4b97 0000 4b77 0000 315f 0000 002c 000e 2250 b27c b66c 0000 04ca 7fff ffff 000c f300
1462040  0200 0db5 0200 234d 0000 4b77 0000 4b97 0000 315f 0000 0034 000e 241c b27c b66c 0000 04cb 7fff ffff 000e 4300 0200 0db5
1462120  0400 242d 0000 4b9f 0000 0013 0000 4b77 0000 21cf 0000 315f 0000 0034 000e 4ccc b27c b66c 0000 04cc 7fff ffff 000e 4d34
1462200  0200 0db5 0400 242d 0000 2727 0000 0013 0000 4b77 0000 21cf 0000 315f 0000 0034 000e 4d00 b27c b66c 0000 04cd 7fff ffff
1462260  000e 4d68 0200 0db5 0400 242d 0000 4ba7 0000 0013 0000 4b77 0000 21cf 0000 315f 0000 0034 000e 4d34 b27c b66c 0000 04ce
1462340  7fff ffff 000e 4d9c 0200 0db5 0400 242d 0000 4baf 0000 001b 0000 4b77 0000 21cf 0000 315f 0000 0034 000e 4d68 b27c b66c
1462420  0000 04cf 7fff ffff 000e 4dd0 0200 0db5 0400 242d 0000 4bb7 0000 0013 0000 4b77 0000 21cf 0000 315f 0000 0034 000e 4d9c
1462500  b27c b66c 0000 04d0 7fff ffff 000e 4e04 0200 0db5 0400 242d 0000 4bbf 0000 0013 0000 4b77 0000 21cf 0000 315f 0000 0034
1462560  000e 4dd0 b27c b66c 0000 04d1 7fff ffff 000e 4e38 0200 0db5 0400 242d 0000 4bc7 0000 001b 0000 4b77 0000 21cf 0000 315f
1462640  0000 0034 000e 4e04 b27c b66c 0000 04d2 7fff ffff 000e 4e6c 0200 0db5 0400 242d 0000 4bcf 0000 0013 0000 4b77 0000 21cf
1462720  0000 315f 0000 0034 000e 4e38 b27c b66c 0000 04d3 7fff ffff 000e 4ea0 0200 0db5 0400 242d 0000 4bd7 0000 0013 0000 4b77
1463000  0000 21cf 0000 315f 0000 0034 000e 4e6c b27c b66c 0000 04d4 7fff ffff 000e 4ed4 0200 0db5 0400 242d 0000 4bdf 0000 0013
1463060  0000 4b77 0000 21cf 0000 315f 0000 0034 000e 4ea0 b27c b66c 0000 04d5 7fff ffff 000e 4f08 0200 0db5 0400 242d 0000 4be7
1463140  0000 0013 0000 4b77 0000 21cf 0000 315f 0000 0034 000e 4ed4 b27c b66c 0000 04d6 7fff ffff 000e 4f3c 0200 0db5 0400 242d
1463220  0000 4bef 0000 001b 0000 4b77 0000 21cf 0000 315f 0000 0034 000e 4f08 b27c b66c 0000 04d7 7fff ffff 000e 4f70 0200 0db5
1463300  0400 242d 0000 4bf7 0000 0013 0000 4b77 0000 21cf 0000 315f 0000 0034 000e 4f3c b27c b66c 0000 04d8 7fff ffff 000e 4fa4
1463360  0200 0db5 0400 242d 0000 4bff 0000 0013 0000 4b77 0000 21cf 0000 315f 0000 0034 000e 4f70 b27c b66c 0000 04d9 7fff ffff
```

```
1463440  000e 4fd8 0200 0db5 0400 242d 0000 4c07 0000 001b 0000 4b77 0000 21cf 0000 315f 0000 0034 000e 4fa4 b27c b66c 0000 04da
1463520  7fff ffff 000e 500c 0200 0db5 0400 242d 0000 4c0f 0000 0013 0000 4b77 0000 21cf 0000 315f 0000 0034 000e 4fd8 b27c b66c
1463600  0000 04db 7fff ffff 000e 5040 0200 0db5 0400 242d 0000 4c17 0000 0013 0000 4b77 0000 21cf 0000 315f 0000 0034 000e 500c
1463660  b27c b66c 0000 04dc 7fff ffff 000e 5074 0200 0db5 0400 242d 0000 4c1f 0000 0013 0000 4b77 0000 21cf 0000 315f 0000 0034
1463740  000e 5040 b27c b66c 0000 04dd 7fff ffff 000e 50a8 0200 0db5 0400 242d 0000 4c27 0000 0013 0000 4b77 0000 21cf 0000 315f
1464020  0000 0034 000e 5074 b27c b66c 0000 04de 7fff ffff 000e 50dc 0200 0db5 0400 242d 0000 4c2f 0000 0013 0000 4b77 0000 21cf
1464100  0000 315f 0000 0034 000e 50a8 b27c b66c 0000 04df 7fff ffff 000e 5110 0200 0db5 0400 242d 0000 4c37 0000 0013 0000 4b77
1464160  0000 21cf 0000 315f 0000 0034 000e 50dc b27c b66c 0000 04e0 7fff ffff 000e 5144 0200 0db5 0400 242d 0000 4c3f 0000 0013
1464240  0000 4b77 0000 21cf 0000 315f 0000 0034 000e 5110 b27c b66c 0000 04e1 7fff ffff 000e 5178 0200 0db5 0400 242d 0000 4c47
1464320  0000 0013 0000 4b77 0000 21cf 0000 315f 0000 0034 000e 5144 b27c b66c 0000 04e2 7fff ffff 000e 51ac 0200 0db5 0400 242d
1464400  0000 4c4f 0000 0013 0000 4b77 0000 21cf 0000 315f 0000 0034 000e 5178 b27c b66c 0000 04e3 7fff ffff 000e 51e0 0200 0db5
1464460  0400 242d 0000 4c57 0000 0013 0000 4b77 0000 21cf 0000 315f 0000 0034 000e 51ac b27c b66c 0000 04e4 7fff ffff 000e 5214
1464540  0200 0db5 0400 242d 0000 4c5f 0000 0013 0000 4b77 0000 21cf 0000 315f 0000 0034 000e 51e0 b27c b66c 0000 04e5 7fff ffff
1464620  000e 5248 0200 0db5 0400 242d 0000 4c67 0000 0013 0000 4b77 0000 21cf 0000 315f 0000 0034 000e 5214 b27c b66c 0000 04e6
1464700  7fff ffff 000e 527c 0200 0db5 0400 242d 0000 4c6f 0000 001b 0000 4b77 0000 21cf 0000 315f 0000 0034 000e 5248 b27c b66c
1464760  0000 04e7 7fff ffff 000e 52b0 0200 0db5 0400 242d 0000 4c77 0000 001b 0000 4b77 0000 21cf 0000 315f 0000 0034 000e 527c
1465040  b27c b66c 0000 04e8 7fff ffff 000e 52e4 0200 0db5 0400 242d 0000 4c7f 0000 001b 0000 4b77 0000 21cf 0000 315f 0000 0034
1465120  000e 52b0 b27c b66c 0000 04e9 7fff ffff 000e 5318 0200 0db5 0400 242d 0000 4c87 0000 0013 0000 4b77 0000 21cf 0000 315f
1465200  0000 0034 000e 52e4 b27c b66c 0000 04ea 7fff ffff 000e 534c 0200 0db5 0400 242d 0000 4c87 0000 001b 0000 4b77 0000 21cf
1465260  0000 315f 0000 0034 000e 5318 b27c b66c 0000 04eb 7fff ffff 000e 5380 0200 0db5 0400 242d 0000 4c8f 0000 001b 0000 4b77
1465340  0000 21cf 0000 315f 0000 0034 000e 534c b27c b66c 0000 04ec 7fff ffff 000e 53b4 0200 0db5 0400 242d 0000 4c97 0000 0023
1465420  0000 4b77 0000 21cf 0000 315f 0000 0034 000e 5380 b27c b66c 0000 04ed 7fff ffff 000e 53e8 0200 0db5 0400 242d 0000 4c9f
1465500  0000 0013 0000 4b77 0000 21cf 0000 315f 0000 0034 000e 53b4 b27c b66c 0000 04ee 7fff ffff 000e 541c 0200 0db5 0400 242d
1465560  0000 4c9f 0000 001b 0000 4b77 0000 21cf 0000 315f 0000 0034 000e 53e8 b27c b66c 0000 04ef 7fff ffff 000e 5450 0200 0db5
1465640  0400 242d 0000 4ca7 0000 0013 0000 4b77 0000 21cf 0000 315f 0000 0034 000e 541c b27c b66c 0000 04f0 7fff ffff 000e 5484
1465720  0200 0db5 0400 242d 0000 4ca7 0000 001b 0000 4b77 0000 21cf 0000 315f 0000 0034 000e 5450 b27c b66c 0000 04f1 7fff ffff
1466000  000e 54b8 0200 0db5 0400 242d 0000 4caf 0000 0013 0000 4b77 0000 21cf 0000 315f 0000 0034 000e 5484 b27c b66c 0000 04f2
1466060  7fff ffff 000e 54ec 0200 0db5 0400 242d 0000 4caf 0000 001b 0000 4b77 0000 21cf 0000 315f 0000 0034 000e 54b8 b27c b66c
1466140  0000 04f3 7fff ffff 000e 5520 0200 0db5 0400 242d 0000 4cb7 0000 0013 0000 4b77 0000 21cf 0000 315f 0000 0034 000e 54ec
1466220  b27c b66c 0000 04f4 7fff ffff 000e 5554 0200 0db5 0400 242d 0000 4cb7 0000 001b 0000 4b77 0000 21cf 0000 315f 0000 0034
1466300  000e 5520 b27c b66c 0000 04f5 7fff ffff 000e 5588 0200 0db5 0400 242d 0000 4cbf 0000 0013 0000 4b77 0000 21cf 0000 315f
1466360  0000 0034 000e 5554 b27c b66c 0000 04f6 7fff ffff 000e 55bc 0200 0db5 0400 242d 0000 4cbf 0000 001b 0000 4b77 0000 21cf
1466440  0000 315f 0000 0034 000e 5588 b27c b66c 0000 04f7 7fff ffff 000e 55f0 0200 0db5 0400 242d 0000 4cc7 0000 0013 0000 4b77
1466520  0000 21cf 0000 315f 0000 0034 000e 55bc b27c b66c 0000 04f8 7fff ffff 000e 5624 0200 0db5 0400 242d 0000 4cc7 0000 001b
1466600  0000 4b77 0000 21cf 0000 315f 0000 0034 000e 55f0 b27c b66c 0000 04f9 7fff ffff 000e 5658 0200 0db5 0400 242d 0000 4ccf
1466660  0000 0013 0000 4b77 0000 21cf 0000 315f 0000 0034 000e 5624 b27c b66c 0000 04fa 7fff ffff 000e 568c 0200 0db5 0400 242d
1466740  0000 4ccf 0000 001b 0000 4b77 0000 21cf 0000 315f 0000 0034 000e 5658 b27c b66c 0000 04fb 7fff ffff 000e 56c0 0200 0db5
1467020  0400 242d 0000 4cd7 0000 0013 0000 4b77 0000 21cf 0000 315f 0000 0034 000e 568c b27c b66c 0000 04fc 7fff ffff 000e 56f4
1467100  0200 0db5 0400 242d 0000 4cd7 0000 001b 0000 4b77 0000 21cf 0000 315f 0000 0034 000e 56c0 b27c b66c 0000 04fd 7fff ffff
1467160  000e 5728 0200 0db5 0400 242d 0000 4cdf 0000 001b 0000 4b77 0000 21cf 0000 315f 0000 0034 000e 56f4 b27c b66c 0000 04fe
1467240  7fff ffff 000e 575c 0200 0db5 0400 242d 0000 4ce7 0000 0013 0000 4b77 0000 21cf 0000 315f 0000 0034 000e 5728 b27c b66c
1467320  0000 04ff 7fff ffff 000c f32c 0200 0db5 0400 242d 0000 4cef 0000 0013 0000 4b77 0000 21cf 0000 315f 000e 58fc 0000 010c
1467400  b27c b66c 0000 0500 0000 054d 000e 57f4 0200 0db5 0500 1cdd 0000 2def 0000 000b 0000 4b77 0074 01e3 0000 02cb 0000 315f
1467460  000e 57f0 0000 002c b4f0 b4e4 0000 04ff 7fff ffff 0008 b0dd 0000 0000 0000 0000 000e 6994 0002 438a 000e 8698 000e 5828
1467540  0000 0038 b27c b66c 0000 0502 0000 054e 000e 582c 0200 0db5 0500 1cdd 0000 4c77 0000 001b 0000 4b77 0073 dc43 0000 02cb
1467620  0000 315f 000e 5960 0000 0038 b27c b66c 0000 0503 0000 054f 000e 5864 0200 0db5 0500 1cdd 0000 4c7f 0000 001b 0000 4b77
1467700  0073 ddc3 0000 02cb 0000 315f 000e 58fc 0000 0038 b27c b66c 0000 0504 0000 0550 000e 5900 0200 0db5 0500 1cdd 0000 4c87
1467760  0000 0013 0000 4b77 0073 dfc3 0000 02cb 0000 315f 2c78 0062 0002 438a 45c4 46d8 aa34 aab4 0000 a4bc 001e 9314 9afc 000c
1470040  3774 4c70 0000 000b 723c 3774 4e1c 0000 9fc0 0007 723c aa34 aab4 0000 a38c 0020 9314 9afc 000e 3774 4e1c 0000 ffff fffb
1470120  723c 3774 4e1c 0000 dfc0 0007 723c 3788 4a7c 000c 723c efb1 000e 59a0 0000 0038 b27c b66c 0000 0505 0000 0551 000e 59a4
1470200  0200 0db5 0500 1cdd 0000 4c87 0000 001b 0000 4b77 0073 e1c3 0000 02cb 0000 315f 2c78 006c 0002 438a 45d0 46ec 4740 9328
1470260  9c10 000e 3844 37f0 379c 234c 000e 8140 9328 9afc 002e 33f4 37f0 42ac 9fc0 0007 000e 8140 001c aa50 aa6c 9de0 aab4 0000
1470340  a424 0008 aa50 af34 723c aa50 9d2c af34 723c 43e4 0300 4c87 6d94 6d50 6d0c 41d4 0000 2a57 242c 0000 000e 8160 000e 5a3c
1470420  0000 0070 b27c b66c 0000 0506 0000 0552 000e 59dc 0200 0db5 0500 1cd4 0000 4bcf 0000 0013 0000 4b77 0073 b683 0000 02cb
1470500  0000 315f 000e 5a3c 0000 0038 b27c b66c 0000 0507 0000 0553 000e 5a40 0200 0db5 0500 1cdd 0000 4baf 0000 001b 0000 4b77
```

```
1470560 0073 b003 0000 02cb 0000 315f 2c78 002a 0002 438a 45b8 46ec 4768 9314 9afc 000a 23fc 0000 000e 81f4 9314 9c10 0008 231c
1470640 000e 8214 c5a8 8bf9 000e 5ae0 0000 0038 b27c b66c 0000 0508 0000 0554 000e 5ae4 0200 0db5 0500 1cdd 0000 4c9f 0000 0013
1470720 0000 4b77 0073 e5c3 0000 02cb 0000 315f 2c73 006a 0002 438a 45c4 46d8 2e7c adec 2ba0 0018 0020 4210 0000 000b 3844 37f0
1471000 4300 0000 ffff fffb 000e 9268 0018 aa50 2e98 22a0 2c58 9314 99e4 002e 9300 93a8 0028 4408 0200 4ca7 6d50 6d0c 44a0 0000
1471060 0200 4c9f 6d50 6d0c 4240 0000 0000 0013 242c 0000 000e 8288 c5a8 5ae6 000e 5be8 0000 0038 b27c b66c 0000 0509 0000 0555
1471140 000e 5bec 0200 0db5 0500 1cdd 0000 4c9f 0000 001b 0000 4b77 0073 e7c3 0000 02cb 0000 315f 2c78 00d0 0002 438a 45d0 46ec
1471220 4740 9328 9c10 0064 2e7c ae30 2ba0 001c 0024 4290 0000 0018 0000 000b 38ac 3858 3804 42ac ffff fffb 000e 82cc 001c aa6c
1471300 2e98 22a0 2c58 9314 93a8 002e 9300 93a8 0028 4408 0300 4ca7 6d94 6d50 6d0c 43e4 0300 4c9f 6d94 6d50 6d0c 41d4 0000 0013
1471360 242c 0000 000e 8288 c5a8 9328 9afc 0014 379c 4a7c 0010 3774 4e1c 0000 0000 0003 723c 9328 93a8 0022 9314 9a90 4224 0018
1471440 0000 000b 38ac 3858 3804 41d4 ffff fffb 242c 0000 000e 82ec 44a0 0000 0300 4c9f 6d94 6d50 6d0c 41d4 0000 2a57 242c 0000
1471520 000e 8160 000e 5cc0 0000 0070 b27c b66c 0000 050a 0000 0556 000e 5c24 0200 0db5 0500 1cdd 0000 4ca7 0000 0013 0000 4b77
1471600 0073 e8c3 0000 02cb 0000 315f 000e 5cc0 0000 0038 b27c b66c 0000 050b 0000 0557 000e 5cc4 0200 0db5 0500 1cdd 0000 4ca7
1471660 0000 001b 0000 4b77 0073 ea43 0000 02cb 0000 315f 2c78 0068 0002 438a 45d0 46ec 4740 9328 9c10 0016 38ac 3858 3804 41d4
1471740 ffff fffb 242c 0000 000e 837c 9328 93a8 0020 4290 0000 0018 0000 000b 38ac 3858 3804 41d4 ffff fffb 242c 0000 000e 82ec
1472020 44a0 0000 0300 4ca7 6d94 6d50 6d0c 41d4 0000 229f 242c 0000 000e 8160 000e 5da4 0000 0078 b27c b66c 0000 050c 0000 0558
1472100 000e 5da8 0200 0db5 0500 1cdd 0000 4caf 0000 0013 0000 4b77 0073 eb43 0000 02cb 0000 315f 000e 5da4 0000 0040 4e1c 0000
1472160 0000 4bb7 5d7c 0000 0200 4bb7 6160 5b58 0100 0ab7 4b9c 0000 0000 229f 56f8 671c 5370 5aec 0100 0ad7 4b8c 0000 0000 229f
1472240 228c 80c8 2c78 006a 0002 438a 45c4 46d8 2e7c adec 2ba0 0018 0020 4210 0000 000b 3844 37f0 4300 0000 0000 0003 000e 8268
1472320 0018 aa50 2e98 22a0 2c58 9314 99e4 002e 9300 93a8 0028 4408 0200 4cb7 6d50 6d0c 44a0 0000 0200 4caf 6d50 6d0c 4240 0000
1472400 0000 0013 242c 0000 000e 8288 c5a8 f2e9 000e 5eac 0000 0038 b27c b66c 0000 050d 0000 0559 000e 5eb0 0200 0db5 0500 1cdd
1472460 0000 4caf 0000 001b 0000 4b77 0073 ecc3 0000 02cb 0000 315f 2c78 00d0 0002 438a 45d0 46ec 4740 9328 9c10 0064 2e7c ae30
1472540 2ba0 001c 0024 4290 0000 0018 0000 000b 38ac 3858 3804 42ac 0000 0003 000e 82cc 001c aa6c 2e98 22a0 2c58 9314 93a8 002e
1472620 9300 93a8 0028 4408 0300 4cb7 6d94 6d50 6d0c 43e4 0300 4caf 6d94 6d50 6d0c 41d4 0000 0013 242c 0000 000e 8288 c5a8 9328
1472700 9afc 0014 379c 4a7c 0010 3774 4e1c 0000 0000 0003 723c 9328 93a8 0022 9314 9a90 4224 0018 0000 000b 38ac 3858 3804 41d4
1472760 0000 0003 242c 0000 000e 82ec 44a0 0000 0300 4caf 6d94 6d50 6d0c 41d4 0000 2a57 242c 0000 000e 8160 000e 5f84 0000 0070
1473040 b27c b66c 0000 050e 0000 055a 000e 5ee8 0200 0db5 0500 1cdd 0000 4cb7 0000 0013 0000 4b77 0073 edc3 0000 02cb 0000 315f
1473120 000e 5f84 0000 0038 b27c b66c 0000 050f 0000 055b 000e 5f88 0200 0db5 0500 1cdd 0000 4cb7 0000 001b 0000 4b77 0073 ef43
1473200 0000 02cb 0000 315f 2c78 0068 0002 438a 45d0 46ec 4740 9328 9c10 0016 38ac 3858 3804 41d4 0000 0003 242c 0000 000e 837c
1473260 9328 93a8 0020 4290 0000 0018 0000 000b 38ac 3858 3804 41d4 0000 0003 242c 0000 000e 82ec 44a0 0000 0300 4cb7 6d94 6d50
1473340 6d0c 41d4 0000 229f 242c 0000 000e 8160 000e 6028 0000 0038 b27c b66c 0000 0510 0000 055c 000e 602c 0200 0db5 0500 1cdd
1473420 0000 4cbf 0000 0013 0000 4b77 0073 f043 0000 02cb 0000 315f 2c78 006a 0002 438a 45c4 46d8 2e7c adec 2ba0 0018 0020 4210
1473500 0000 000b 3844 37f0 4300 0000 0000 000b 000e 8268 0018 aa50 2e98 22a0 2c58 9314 99e4 002e 9300 93a8 0028 4408 0200 4cc7
1473560 6d50 6d0c 44a0 0000 0200 4cbf 6d50 6d0c 4240 0000 0000 0013 242c 0000 000e 8288 c5a8 0df7 000e 6130 0000 0038 b27c b66c
1473640 0000 0511 0000 055d 000e 6134 0200 0db5 0500 1cdd 0000 4cbf 0000 001b 0000 4b77 0073 f1c3 0000 02cb 0000 315f 2c78 00d0
1473720 0002 438a 45d0 46ec 4740 9328 9c10 0064 2e7c ae30 2ba0 001c 0024 4290 0000 0018 0000 000b 38ac 3858 3804 42ac 0000 000b
1474000 000e 82cc 001c aa6c 2e98 22a0 2c58 9314 93a8 002e 9300 93a8 0028 4408 0300 4cc7 6d94 6d50 6d0c 43e4 0300 4cbf 6d94 6d50
1474060 6d0c 41d4 0000 0013 242c 0000 000e 8288 c5a8 9328 9afc 0014 379c 4a7c 0010 3774 4e1c 0000 0000 0003 723c 9328 93a8 0022
1474140 9314 9a90 4224 0018 0000 000b 38ac 3858 3804 41d4 0000 000b 242c 0000 000e 82ec 44a0 0000 0300 4cbf 6d94 6d50 6d0c 41d4
1474220 0000 2a57 242c 0000 000e 8160 000e 6208 0000 0070 b27c b66c 0000 0512 0000 055e 000e 616c 0200 0db5 0500 1cdd 0000 4cc7
1474300 0000 0013 0000 4b77 0073 f2c3 0000 02cb 0000 315f 000e 6208 0000 0038 b27c b66c 0000 0513 0000 055f 000e 620c 0200 0db5
1474360 0500 1cdd 0000 4cc7 0000 001b 0000 4b77 0073 f443 0000 02cb 0000 315f 2c78 0068 0002 438a 45d0 46ec 4740 9328 9c10 0016
1474440 38ac 3858 3804 41d4 0000 000b 242c 0000 000e 837c 9328 93a8 0020 4290 0000 0018 0000 000b 38ac 3858 3804 41d4 0000 000b
1474520 242c 0000 000e 82ec 44a0 0000 0300 4cc7 6d94 6d50 6d0c 41d4 0000 229f 242c 0000 000e 8160 000e 62ac 0000 0038 b27c b66c
1474600 0000 0514 0000 0560 000e 62b0 0200 0db5 0500 1cdd 0000 4ccf 0000 0013 0000 4b77 0073 f543 0000 02cb 0000 315f 2c78 006a
1474660 0002 438a 45c4 46d8 2e7c adec 2ba0 0018 0020 4210 0000 000b 3844 37f0 4300 0000 0000 0013 000e 8268 0018 aa50 2e98 22a0
1474740 2c58 9314 99e4 002e 9300 93a8 0028 4408 0200 4cd7 6d50 6d0c 44a0 0000 0200 4ccf 6d50 6d0c 4240 0000 0000 0013 242c 0000
1475020 000e 8288 c5a8 fd7d 000e 63b4 0000 0038 b27c b66c 0000 0515 0000 0561 000e 63b8 0200 0db5 0500 1cdd 0000 4ccf 0000 001b
1475100 0000 4b77 0073 f743 0000 02cb 0000 315f 2c78 00d0 0002 438a 45d0 46ec 4740 9328 9c10 0064 2e7c ae30 2ba0 001c 0024 4290
1475160 0000 0018 0000 000b 38ac 3858 3804 42ac 0000 0013 000e 82cc 001c aa6c 2e98 22a0 2c58 9314 93a8 002e 9300 93a8 0028 4408
1475240 0300 4cd7 6d94 6d50 6d0c 43e4 0300 4ccf 6d94 6d50 6d0c 41d4 0000 0013 242c 0000 000e 8288 c5a8 9328 9afc 0014 379c 4a7c
1475320 0010 3774 4e1c 0000 0000 0003 723c 9328 93a8 0022 9314 9a90 4224 0018 0000 000b 38ac 3858 3804 41d4 0000 0013 242c 0000
1475400 000e 82ec 44a0 0000 0300 4ccf 6d94 6d50 6d0c 41d4 0000 2a57 242c 0000 000e 8160 000e 648c 0000 0070 b27c b66c 0000 0516
1475460 0000 0562 000e 63f0 0200 0db5 0500 1cdd 0000 4cd7 0000 0013 0000 4b77 0073 f8a3 0000 02cb 0000 315f 000e 648c 0000 0038
1475540 b27c b66c 0000 0517 0000 0563 000e 6490 0200 0db5 0500 1cdd 0000 4cd7 0000 001b 0000 4b77 0073 fa23 0000 02cb 0000 315f
1475620 2c78 0068 0002 438a 45d0 46ec 4740 9328 9c10 0016 38ac 3858 3804 41d4 0000 0013 242c 0000 000e 837c 9328 93a8 0020 4290
```

```
1475700 0000 0018 0000 000b 38ac 3858 3804 41d4 0000 0013 242c 0000 000e 82ec 44a0 0000 0300 4cd7 6d94 6d50 6d0c 41d4 0000 229f
1475760 242c 0000 000e 8160 000e 65a4 0000 0038 b27c b66c 0000 0518 0000 0564 000e 65a8 0200 0db5 0500 1cdd 0000 4c97 0000 0023
1476040 0000 4b77 0073 e443 0000 02cb 0000 315f 2c78 c0ac 0002 438a 45dc 4700 4754 47a8 933c 9c10 0010 38ac 3858 3804 37b0 234c
1476120 000e 8190 933c 93a8 0066 3540 0018 001c 38ac 3858 3804 32f0 0020 247c 000e 84d0 0024 aa88 001c aab4 0001 a1d0 000c 3df4
1476200 0020 4a7c 0018 723c aa88 001c aab4 0002 a1d0 002a 4268 0000 0000 0003 44a0 0000 0400 4c97 6dd8 6d94 6d50 6d0c 4240 0000
1476260 0000 000b 242c 0000 000e 8288 c5a8 43e4 0400 4c97 6dd8 6d94 6d50 6d0c 4240 0000 0000 229f 242c 0000 000e 8160 0031 7e4e
1476340 2120 4172 6775 6d65 6e74 207e 7720 6f66 207e 772f 7e77 2063 616e 6e6f 7420 6265 2063 6f6e 7374 7275 6374 6564 2e7e 6e00
1476420 000e 6660 0000 0038 b27c b66c 0000 0519 0000 0565 000e 6664 0200 0db5 0500 1cdd 0000 4d1f 0000 001b 0000 4b77 0074 1443
1476500 0000 02cb 0000 315f 2c78 0094 0002 438a 45d0 46ec 4740 3410 001c 3364 3788 6f34 4550 6e1c 001c 5370 4538 6dd8 6bb4 4568
1476560 6d94 6b74 4254 0000 0000 4d57 4300 0000 0000 328f 0008 c11c 0014 4568 6d50 5370 4254 0000 0000 4d5f 4300 0000 0000 328f
1476640 0008 c11c 0010 9300 9afc 0005 2c88 001c 4568 6d0c 5370 41e8 0000 4d67 4300 0000 0000 328f 0008 c11c 000c c5a8 000e 679c
1476720 0000 00b8 b27c b66c 0000 051a 0000 0566 000e 67a0 0200 0db5 0500 1cdd 0000 2ecf 0000 0013 0000 4b77 0074 0b03 0000 02cb
1477000 0000 315f 000e 679c 0000 0080 0000 0000 000e 8508 0000 0000 0000 0000 0000 0000 0000 0000 0000 0000 0000 0000 0000 0000
1477060 0000 0000 0000 0000 0000 0000 0000 0000 0000 0000 0000 0000 0000 0000 000e 84b0 000e 8248 000e 8308 000e 81dd 000e 83a8
1477140 000e 83e0 000e 83fc 000e 8519 000e 866d 000e 85fc 000e 8538 000e 8564 0000 0000 0000 0000 2c78 0084 0002 438a 45b8 4700
1477220 3410 001c 3364 379c 6f34 33bc 3804 41d4 0000 000b 6c74 4538 6e1c 001c 5370 4550 6dd8 6b74 4538 4af8 0000 000b 6bb4 4568
1477300 4b8c 0000 0000 2227 6b74 41e8 0000 344f 4300 0000 0000 328f 0008 c11c 0018 4550 6d94 5370 4538 6d50 6bb4 4568 6d0c 6b74
1477360 4254 0000 0000 084f 4300 0000 0000 328f 0008 c11c 000c c5a8 000f 61fc 0000 0394 b27c b66c 0000 051b 0000 0567 000e 67d8
1477440 0200 0db5 0500 1cdd 0000 4ce7 0000 0013 0000 4b77 0073 fd83 0000 02cb 0000 315f 000e 680c 0000 0038 b27c b66c 0000 051c
1477520 0000 0568 000e 6810 0200 0db5 0500 1cdd 0000 4cef 0000 0013 0000 4b77 0073 ff03 0000 02cb 0000 315f 000e 6990 0000 0038
1477600 b27c b66c 0000 051d 0000 0569 000e 6994 0200 0db5 0500 1cdd 0000 22df 0000 0013 0000 4b77 0074 2f63 0000 02cb 0000 315f
1477660 000e 6990 0000 014c 5d10 0000 0100 3037 4b8c 0000 0000 4d77 5758 4af8 0000 4b9f 55f0 4af8 0000 2727 55f0 4af8 0000 4ba7
1477740 55f0 4af8 0000 4baf 55f0 4af8 0000 4bb7 55f0 4af8 0000 4bd7 55f0 4af8 0000 4bbf 55f0 4af8 0000 4bc7 55f0 4af8 0000 4bdf
1500020 55f0 4af8 0000 4be7 55f0 4af8 0000 4bef 55f0 4af8 0000 4bf7 55f0 4af8 0000 4bff 55f0 4af8 0000 4c07 55f0 4af8 0000 4c0f
1500100 55f0 4af8 0000 4c2f 55f0 4af8 0000 4c4f 55f0 4af8 0000 4c17 55f0 4af8 0000 4c37 55f0 4af8 0000 4c57 55f0 4af8 0000 4c6f
1500160 55f0 4af8 0000 4c1f 55f0 4af8 0000 4c3f 55f0 4af8 0000 4c5f 55f0 4af8 0000 4c27 55f0 4af8 0000 4c47 55f0 4af8 0000 4c67
1500240 55f0 4af8 0000 4d07 55f0 4af8 0000 4d7f 55f0 4af8 0000 4cff 55f0 4af8 0000 4d17 55f0 4af8 0000 4d27 55f0 4af8 0000 4d37
1500320 55f0 4af8 0000 4d3f 55f0 4af8 0000 4d2f 55f0 4af8 0000 4d47 55f0 4af8 0000 4d4f 55f0 4af8 0000 4d87 5370 228c 000e 69c8
1500400 0000 0038 b130 b66c 0000 051e 0000 056a 000e 57c9 0200 0db5 0500 1cdd 0000 22d7 0000 0013 0000 4b77 0074 3223 0000 02cb
1500460 0000 315f 000e 6a08 0000 0040 4e1c 0000 0000 4b9f 5d7c 0000 0200 4b9f 6160 5b58 0100 0ab7 4b8c 0000 0000 229f 56f8 671c
1500540 5370 5aec 0100 0ad7 4b8c 0000 0000 229f 228c 3899 000e 6a48 0000 0040 4e1c 0000 0000 2727 5d7c 0000 0200 2727 6160 5b58
1500620 0100 0ab7 4b8c 0000 0000 229f 56f8 671c 5370 5aec 0100 0ad7 4b8c 0000 0000 229f 228c 2a87 000e 6a88 0000 0040 4e1c 0000
1500700 0000 4ba7 5d7c 0000 0200 4ba7 6160 5b58 0100 0ab7 4b8c 0000 0000 229f 56f8 671c 5370 5aec 0100 0ad7 4b8c 0000 0000 229f
1500760 228c 6a69 000e 6adc 0000 0054 4e1c 0000 0000 4baf 5d7c 0000 0300 4d0f 6784 6160 5de8 0000 0100 0ab7 4b8c 0000 0000 229f
1501040 5d7c 0000 0100 0ab7 4b8c 0000 0000 229f 56f8 671c 5370 5aec 0100 0ad7 4b8c 0000 0000 229f 228c fcb5 000e 6ea4 0000 0054
1501120 4e1c 0000 0000 4d07 5d7c 0000 0300 4d07 6784 6160 5de8 0000 0100 0ab7 4b8c 0000 0000 229f 5d7c 0000 0100 0ab7 4b8c 0000
1501200 0000 253f 56f8 671c 5370 5aec 0100 0ad7 4b8c 0000 0000 229f 228c 6b11 b464 0000 000b 370c 0015 3514 ffff ffff 0200 4b0f
1501260 0000 4ae7 0000 0008 000e 6d28 000e 6d28 0001 0058 0000 0000 000e 6b38 0300 4b0f 0000 4ae7 0000 000c 000e 6d60 000e 6d60
1501340 0001 0058 0000 0000 ffff ffff 0100 4b17 0000 4ae7 0000 0004 000e 6da8 000e 6da8 0001 0058 0000 0000 000e 6b78 0200 4b17
1501420 0000 4ae7 0000 0008 000e 6dc8 000e 6dc8 0001 0058 0000 0000 000e 6b98 0300 4b17 0000 4ae7 0000 000c 000e 6de0 000e 6de0
1501500 0001 0058 0000 0000 000b abe4 0100 4b1f 0000 4ae7 0000 0004 000e 6e28 000e 6e28 0001 0058 0000 0000 000e 6bd8 0200 4b1f
1501560 0000 4ae7 0000 0008 000e 6e48 000e 6e48 0001 0058 0000 0000 000e 6bf8 0300 4b1f 0000 4ae7 0000 000c 000e 6e60 000e 6e60
1501640 0001 0058 0000 0000 000b ac14 0200 4b27 0000 4ae7 0000 0008 000e 44a4 000e 44a4 0001 0058 0000 0000 0003 746f 6b00 0000
1501720 0012 53f8 000b 4d7c 001a 2240 2023 2938 392f 3037 2f31 3720 6374 722e 706c 0933 332e 3122 000d bc48 000e 43a0 0100 2def
1502000 0000 4ae7 0000 0004 000e 6cd0 000e 6cd0 0001 0058 0000 0000 0000 0028 000e 43d8 b27c b66c 0000 04a0 7fff ffff 000e 4894
1502060 0200 0db5 0100 32b5 0000 4ae7 0000 315f 2cac 23ff 0002 438a 2ca0 6cde 0000 0000 0000 0001 000d d9a0 000d d9a0 0002 438a
1502140 000e 6cf4 000d d9ac 0005 6374 722e 6f00 000d 7f18 0200 4b37 0000 4ae7 0000 0008 000e 728c 000e 728c 0021 0000 0000 0000
1502220 0003 6578 7000 0000 2c78 0018 0002 438a 4268 0000 0000 0013 239c 0000 000e 6d50 ffff ffff 0300 4b3f 0000 4ae7 0000 000c
1502300 000e 7250 000e 7250 0021 0000 0000 0000 2c78 0018 0002 438a 427c 0000 0000 0013 239c 0000 000e 6d88 000b af08 0400 4b47
1502360 0000 4ae7 0000 0010 000e 726c 000e 726c 0021 0000 0000 0000 0000 4b77 b328 0579 000e 4ca4 0000 0000 2c78 0020 0002 438a
1502440 4268 0000 0000 0003 4254 0000 0000 000b 239c 0000 000e 6d50 2c78 0018 0002 438a 4268 0000 0000 0003 239c 0000 000e 6d50
1502520 2c78 0018 0002 438a 427c 0000 0000 0003 239c 0000 000e 6d88 2c78 0010 0002 438a 239c 0000 000e 6e18 000b b278 0200 4b9f
1502600 0000 4b77 0000 0008 000f 4e90 000f 4e90 0021 0000 0000 0000 2c78 0020 0002 438a 4268 0000 0000 000b 4254 0000 0000 000b
1502660 239c 0000 000e 6d50 2c78 0018 0002 438a 4268 0000 0000 000b 239c 0000 000e 6d50 2c78 0018 0002 438a 427c 0000 0000 000b
1502740 239c 0000 000e 6d88 000c f028 0200 224f 0000 4ae7 0000 0008 000a 18f0 000a 18f0 0000 0000 0000 0000 0004 6d61 7468 0000
```

```
1503020  000c ef24 0000 0024 2ca0 6eae 0000 0000 0000 0001 000e 26dc 000e 26dc 0002 438a 000e 48b4 000d 185c 0200 22d7 0000 4ae7
1503100  0000 0008 000a 18f0 000a 18f0 0000 0000 0000 0000 000c 6465 636f 6465 5f66 6c6f 6174 0000 0003 706f 7700 0000 0005 6c6f
1503160  6731 3000 000e 6ea4 0000 0024 2ca0 0159 0000 000c 0000 0003 000e 2748 000e 27fc 0002 438a 000e 6f34 b464 d82c 000b 0038
1503240  000e 6b2c 000d 20b0 0000 0010 000e 2808 000e 2754 000e 6ec4 0300 22d7 0000 4ae7 0000 000c 000a 18f0 000a 18f0 0000 0000
1503320  0000 0000 0005 5150 5f4c 3300 000e 6f8c 0000 4b07 b328 04b5 000a e5b8 0000 0000 2c78 0012 0002 438a 4e1c 0000 0000 4cf7
1503400  228c 0000 0000 002c 000d 1950 b27c b66c 0000 04ae 7fff ffff 000e 6fc8 0200 0db5 0200 22ed 0000 4b3f 0073 80c3 0000 315f
1503460  0000 002c 000e 6f9c b27c b66c 0000 04af 7fff ffff 000a d3e4 0200 0db5 0200 22ed 0000 4b47 0073 84c3 0000 315f 0010 6f72
1503540  645f 696e 7465 7273 6563 7469 6f6e 0080 1500 039c 900a 201f 912a 2002 9412 a128 81c3 e008 d002 000a 8090 000a 0280 0008
1503620  80a2 a001 0280 000f 80a2 a002 2280 0016 0500 039c 81c3 e008 0100 0000 1700 039c 900a 201f 912a 2002 9612 e128 9002 000b
1503700  d802 0000 9803 0009 10bf fff7 d822 0000 1b00 039c 900a 201f 912a 2002 9a13 6128 9002 000d c202 0000 8220 4009 10bf ffee
1503760  c222 0000 900a 201f 912a 2002 8410 a128 10bf ffe9 d222 0002 1700 039c 900a 201f 912a 2002 9612 e128 9002 000b da02 0000
1504040  909c 000a 0280 0008 80a2 a001 0280 000a 90a2 a002 0280 000c 0100 0000 81c3 e008 9000 000d d802 0000 9803 0009 10bf fffc
1504120  d822 0000 c202 0000 8220 4009 10bf fff6 c222 0000 10bf fff6 d222 0000 0000 0000 000e 7018 000e 7038 000e 7000 0000 0000
1504200  4928 2329 3838 2f31 312f 3032 2063 7472 2e63 0932 372e 3200 0000 0000 0000 0000 0000 0000 0000 0000 0000 0000 0000 0000
1504260  0000 0000 0000 0000 0000 0000 0000 0000 0000 0000 0000 0000 0000 0000 0000 0000 0000 0000 0000 0000 0000 0000 0000 0000
*
1504560  0000 4b3f b328 0051 000e 6fa0 0000 0000 0000 4b47 b328 0119 000e 6fcc 0000 0000 000b dc04 0000 0000 000e 7210 000e 7220
1504640  0000 4b37 b328 b9f1 000a d3e8 0000 0000 000b dc14 0000 0000 000f 4c30 000e 7240 2c78 001c 0002 438a 7ae4 0000 813c 8130
1504720  8124 7c28 000e 7018 000c 228c 2c78 001e 0002 438a 7ae4 0000 8148 8130 8124 7c28 000e 7098 000c 88ec 228c 723c 2c78 001a
1505000  0002 438a 7ae4 0000 8124 7c28 000e 7000 0004 88d0 228c b961 000e 6f38 0000 0010 000e 8610 0000 0008 000e 6f72 645f 7365
1505060  7470 726f 6475 6374 000e 6fec 000c 8588 000e 6b58 0200 4b0f 0000 3287 0000 0008 000e 4600 000e 4600 0041 0000 0000 0000
1505140  000e 72d0 0300 4b0f 0000 3287 0000 000c 000e 7310 000e 7310 0041 0000 0000 0000 2c78 0010 0002 438a 239c 0000 000e 6b68
1505220  000e 6bb8 0100 4b17 0000 3287 0000 0004 000e 7340 000e 7340 0041 0000 0000 0000 2c78 0010 0002 438a 239c 0000 000e 6b88
1505300  000e 7320 0200 4b17 0000 3287 0000 0008 000e 7370 000e 7370 0041 0000 0000 0000 2c78 0010 0002 438a 239c 0000 000e 6ba8
1505360  000e 7350 0300 4b17 0000 3287 0000 000c 000e 73a0 000e 73a0 0041 0000 0000 0000 2c78 0010 0002 438a 239c 0000 000e 6bc8
1505440  000e 6c18 0100 4b1f 0000 3287 0000 0004 000e 73d0 000e 73d0 0041 0000 0000 0000 2c78 0010 0002 43da 239c 0000 000e 6be8
1505520  000e 73b0 0200 4b1f 0000 3287 0000 0008 000e 7400 000e 7400 0041 0000 0000 0000 2c78 0010 0002 438a 239c 0000 000e 6c08
1505600  000e 73e0 0300 4b1f 0000 3287 0000 000c 000e 7430 000e 7430 0041 0000 0000 0000 2c78 0010 0002 438a 239c 0000 000e 6c28
1505660  000e 6c38 0200 4b27 0000 3287 0000 0008 000e 7460 000e 7460 0041 0000 0000 0000 2c78 0010 0002 438a 239c 0000 000e 6c48
1505740  29c8 99c4 000f 549c 0010 890a 0006 6672 6f75 6e64 000e 7488 0007 6365 696c 696e 6700 7494 0008 7472 756e 6361 7465 00a0
1506020  0006 6666 6c6f 6f72 000e 74ac 0006 6374 722e 706c 000e 74b8 0005 6879 706f 7400 0003 6162 7300 0261 0004 6661 6273 00e5
1506100  0002 6a30 000e 0329 0002 6a31 000e 03ad 0002 6a6e 0000 32df 0002 7930 000e 3adc 0002 7931 000d b7b1 0002 796e 000e 3aec
1506160  0003 7369 6e00 b7c8 0004 6173 696e 00d0 0004 7369 6e68 00f4 0005 6173 696e 6800 0003 636f 7300 7511 0004 6163 6f73 0080
1506240  0004 636f 7368 0088 0005 6163 6f73 6800 0003 7461 6e00 0ad7 0004 6174 616e 0039 0004 7461 6e68 00df 0005 6174 616e 6800
1506320  0005 6174 616e 3200 0003 6d61 7800 3b18 0003 6d69 6e00 b738 0004 7369 676e 0040 0005 7363 616c 6500 0005 666c 6f6f 7200
1506400  0005 726f 756e 6400 0004 6365 696c 00f0 0004 6361 6273 00f8 000a 43d8 0000 0000 0008 ca8c 0200 2727 0000 4b77 0000 0008
1506460  000f 4eac 000f 4eac 0021 0000 0000 0000 0008 d5cc 0200 4ba7 0000 4b77 0000 0008 000f 4ec8 000f 4ec8 0021 0000 0000 0000
1506540  000b dcd4 0300 4baf 0000 4b77 0000 000c 000e 5a0c 000e 5a0c 0001 0059 0000 0000 0000 4baf b328 75f4 000e 4d6c 0000 0000
1506620  000a 4128 0000 0000 000e 7610 000e 7620 ffff ffff 0200 4bb7 0000 4b77 0000 0008 000f 4f04 000f 4f04 0021 0000 0000 0000
1506700  0000 4bb7 b328 32df 000e 4da0 0000 0000 ffff ffff 0200 4bbf 0000 4b77 0000 0008 000f 4f3c 000f 4f3c 0021 0000 0000 0000
1506760  0000 4bbf b328 7664 000e 4dd4 0000 0000 ffff ffff 0300 4bc7 0000 4b77 0000 000c 000f 4f58 000f 4f58 0021 0000 0000 0000
1507040  0000 4bc7 b328 0ad7 000e 4e08 0000 0000 0009 d64c 0200 4bcf 0000 4b77 0000 0008 000e 81a0 000e 81a0 0001 0059 0000 0000
1507120  0000 4bcf b328 05bd 000e 4e3c 0000 0000 000a 3140 0000 0000 000e 76e0 000e 76f0 0008 d66c 0200 4bd7 0000 4b77 0000 0008
1507200  000f 4f20 000f 4f20 0021 0000 0000 0000 0009 4bd7 b328 32df 000e 4e70 0000 0000 0008 d6ac 0200 4bdf 0000 4b77 0000 0008
1507260  000f 4f78 000f 4f78 0021 0000 0000 0000 0000 4bdf b328 7734 000e 4ea4 0000 0000 000a 4138 0000 0000 000e 7750 000e 7760
1507340  ffff ffff 0200 4be7 0000 4b77 0000 0008 000f 4f94 000f 4f94 0021 0000 0000 0000 0000 4be7 b328 32df 000e 4ed8 0000 0000
1507420  ffff ffff 0300 4bef 0000 4b77 0000 000c 000f 4fb0 000f 4fb0 0021 0000 0000 0000 0000 4bef b328 77a4 000e 4f0c 0000 0000
1507500  ffff ffff 0200 4bf7 0000 4b77 0000 0008 000f 4fd0 000f 4fd0 0021 0000 0000 0000 0000 4bf7 b328 0ad7 000e 4f40 0000 0000
1507560  0008 d6ec 0200 4bff 0000 4b77 0000 0008 000f 4fec 000f 4fec 0021 0000 0000 0000 0000 4bff b328 32df 000e 4f74 0000 0000
1507640  000a 315c 0000 0000 000e 7820 000e 7830 0008 d70c 0300 4c07 0000 4b77 0000 000c 000f 5008 000f 5008 0021 0000 0000 0000
1507720  0000 4c07 b328 7851 000e 4fa8 0000 0000 000a 4148 0000 0000 000e 7860 000e 7870 0008 d72c 0200 4c0f 0000 4b77 0000 0008
1510000  000f 5028 000f 5028 0021 0000 0000 0000 0000 4c0f b328 b3c1 000e 4fdc 0000 0000 000a 4158 0000 0000 000e 78a0 000e 78b0
1510060  ffff ffff 0200 4c17 0000 4b77 0000 0008 000f 507c 000f 507c 0021 0000 0000 0000 0000 4c17 b328 b398 000e 5010 0000 0000
1510140  0008 d74c 0200 4c1f 0000 4b77 0000 0008 000f 50f0 000f 50f0 0021 0000 0000 0000 0000 4c1f b328 0749 000e 5044 0000 0000
1510220  000a 4168 0000 0000 000e 7910 000e 7920 0008 d78c 0200 4c27 0000 4b77 0000 0008 000f 5144 000f 5144 0021 0000 0000 0000
```

```
1510300  0000 4c27 b328 0959 000e 5078 0000 0000 000a 4178 0000 0000 000e 7950 000e 7960 ffff ffff 0200 4c2f 0000 4b77 0000 0008
1510360  000f 5044 000f 5044 0021 0000 0000 0000 0000 4c2f b328 0b69 000e 50ac 0000 0000 000b de94 0200 4c37 0000 4b77 0000 0008
1510440  000f 5098 000f 5098 0021 0000 0000 0000 0000 4c37 b328 0cf5 000e 50e0 0000 0000 000e 79c0 000b b0d4 000b ded4 0200 4c3f
1510520  0000 4b77 0000 0008 000f 510c 000f 510c 0021 0000 0000 0000 0000 4c3f b328 0f05 000e 5114 0000 0000 000e 79f8 000b abb4
1510600  000b def4 0200 4c47 0000 4b77 0000 0008 000f 5160 000f 5160 0021 0000 0000 0000 0000 4c47 b328 0851 000e 5148 0000 0000
1510660  000e 7a30 000b df14 000b df24 0200 4c4f 0000 4b77 0000 0008 000f 5060 000f 5060 0021 0000 0000 0000 0000 4c4f b328 0a1d
1510740  000e 517c 0000 0000 0012 cb74 000a 2e60 0003 656f 6660 0000 000b df44 0200 4c57 0000 4b77 0000 0008 000f 50b4 000f 50b4
1511020  0021 0000 0000 0000 0000 4c57 b328 080d 000e 51b0 0000 0000 0003 786f 7200 0000 000e 42bc 0000 0000 000b df74 0200 4c5f
1511100  0000 4b77 0000 0008 000f 5128 000f 5128 0021 0000 0000 0000 0000 4c5f b328 3c3c 000e 51e4 0000 0000 0010 b2f8 000e 7b40
1511160  0004 7769 7468 0000 000b dfa4 0200 4c67 0000 4b77 0000 0008 000f 517c 000f 517c 0021 0000 0000 0000 0000 4c67 b328 b300
1511240  000e 5218 0000 0000 0005 7768 696c 6500 0010 1f44 0000 0000 ffff ffff 0300 4c6f 0000 4b77 0000 000c 000f 50d0 000f 50d0
1511320  0021 0000 0000 0000 0000 4c6f b328 3c78 000e 524c 0000 0000 ffff ffff 0300 4c77 0000 4b77 0000 000c 000e 80a8 000e 80a8
1511400  0001 0059 0000 0000 0000 4c77 b328 b270 000e 5280 0000 0000 000c 03b4 0300 4c7f 0000 4b77 0000 000c 000e 80e8 000e 80e8
1511460  0001 0059 0000 0000 0000 4c7f b328 080d 000e 52b4 0000 0000 0002 746f 0000 0000 0004 7468 656e 0000 0008 b04c 0200 4c87
1511540  0000 4b77 0000 0008 000e 5894 000e 5894 0001 0059 0000 0000 0000 4c87 b464 b230 000e 52e8 000d 826c 0010 b168 0000 0000
1511620  0010 b1a4 000e 7c18 000e 7be8 0300 4c87 0000 4b77 0000 000c 000e 5930 000e 5930 0001 0059 0000 0000 0008 b06c 0300 4c8f
1511700  0000 4b77 0000 000c 000f 51b8 000f 51b8 0021 0000 0000 0000 0000 4c8f b328 3cd0 000e 5350 0000 0000 ffff ffff 0400 4c97
1511760  0000 4b77 0000 0010 000e 64c0 000e 64c0 0001 0059 0000 0000 0000 4c97 b328 b150 000e 5384 0000 0000 0008 b0ac 0200 4c9f
1512040  0000 4b77 0000 0008 000e 5a70 000e 5a70 0001 0059 0000 0000 0000 4c9f b464 0915 000e 53b8 000d 82b4 0010 af38 0000 0000
1512120  0003 7265 6d00 0000 000e 7ca8 0300 4c9f 0000 4b77 0000 000c 000e 5b14 000e 5b14 0001 0059 0000 0000 000c 0430 0200 4ca7
1512200  0000 4b77 0000 0008 000e 8318 000e 8318 0001 0059 0000 0000 0000 4ca7 b464 3cec 000e 5420 000d 82cc 000e 7d08 0300 4ca7
1512260  0000 4b77 0000 000c 000e 5c54 000e 5c54 0001 0059 0000 0000 ffff ffff 0200 4caf 0000 4b77 0000 0008 000e 5d34 000e 5d34
1512340  0001 0059 0000 0000 0000 4caf b464 3337 000e 5488 000d 8308 000e 7d58 0300 4caf 0000 4b77 0000 000c 000e 5dd8 000e 5dd8
1512420  0001 0059 0000 0000 ffff ffff 0200 4cb7 0000 4b77 0000 0008 000e 83b8 000e 83b8 0001 0059 0000 0000 0000 4cb7 b464 0ad7
1512500  000e 54f0 000d 238c 000e 7da8 0300 4cb7 0000 4b77 0000 000c 000e 5f18 000e 5f18 0001 0059 0000 0000 000c 05d0 0200 4cbf
1512560  0000 4b77 0000 0008 000e 5fb8 000e 5fb8 0001 0059 0000 0000 0000 4cbf b464 0ae5 000e 5558 000d 706c 000e 7df8 0300 4cbf
1512640  0000 4b77 0000 000c 000e 605c 000e 605c 0001 0059 0000 0000 ffff ffff 0200 4cc7 0000 4b77 0000 0008 000e 840c 000e 840c
1512720  0001 0059 0000 0000 0000 4cc7 b464 afa0 000e 55c0 000d d828 000e 7e48 0300 4cc7 0000 4b77 0000 000c 000e 619c 000e 619c
1513000  0001 0059 0000 0000 000c 06fc 0200 4ccf 0000 4b77 0000 0008 000e 623c 000e 623c 0001 0059 0000 0000 0000 4ccf b464 af60
1513060  000e 5628 000e 7ef8 000a 3194 0300 0000 000e 7eb8 000e 7ec8 000e 7e98 0300 4ccf 0000 4b77 0000 000c 000e 62e0 000e 62e0
1513140  0001 0059 0000 000c b464 7eac 000e 565c 0000 0000 0008 d8ec 0200 4cd7 0000 4b77 0000 0008 000e 8470 000e 8470 0001 0059
1513220  0000 0000 0000 4cd7 b464 7f2e 000e 5690 000e 7f54 000e 7f04 0300 4cd7 0000 4b77 0000 000c 000e 6420 000e 6420 0001 0059
1513300  0000 0000 b464 0479 000e 56c4 0000 0000 000c 06dc 0300 4cdf 0000 4b77 0000 000c 000f 52d4 000f 52d4 0021 0000 0000 0000
1513360  0000 4cdf b328 0aa1 000e 56f8 0000 0000 000a 41c8 0000 0000 000e 7f80 000e 7f90 000c 0724 0200 4ce7 0000 4b77 0000 0008
1513440  000e 8548 000e 8548 0001 0059 0000 0000 0000 4ce7 b328 0aa1 000e 572c 0000 0000 000c 0684 0200 4cef 0000 4b77 0000 0008
1513520  000e 8598 000e 8598 0001 0059 0000 0000 0000 4cef b328 aeb1 000e 5760 0000 0000 000e 7ff0 000a 3758 001e 2240 2823 2938
1513600  392f 3132 2f32 3720 6d61 7468 2e70 6c20 2020 2033 362e 3222 0000 2a87 000e 6c88 0100 2def 0000 4b77 0000 0004 000e 806c
1513660  000e 806c 0001 0059 0000 0000 0000 4e37 b328 23ff 000c f468 0000 0000 0000 4b77 b328 3dcc 000e 4898 0000 0000 2cac 3dd8
1513740  0002 438a 2ca0 ae38 0000 0000 0000 0001 000e 6f80 000e 6f80 0002 438a 000e 6f6c 0000 4e2f b328 8081 000c f434 0000 0000
1514020  000e 80d8 000a 3440 2c78 0020 0002 438a 45c4 4740 aa34 a874 a38c 0008 a874 af34 723c aa34 af34 723c 0000 4e27 b328 0c2d
1514100  000c f400 0000 0000 0000 4e0f b328 804c 000c f364 0000 0000 2c78 0020 0002 438a 45c4 4740 a874 aa34 a38c 0008 a874 af34
1514160  723c aa34 af34 723c 0000 4e1f b328 adbc 000c f3cc 0000 0000 0008 636f 7079 7369 676e 00f8 29c8 9b30 000f 9b38 000f 6a72
1514240  000c 089c 0300 4cff 0000 4b77 0000 000c 000f 51d8 000f 51d8 0021 0000 0000 0000 000c 6564 0200 2ecf 0000 4b77 0000 0008
1514320  000e 6714 000e 6714 0001 0059 0000 0000 0000 4e17 b328 a418 000c f398 0000 0000 0008 b22c 0400 4d47 0000 4b77 0000 0010
1514400  000f 5284 000f 5284 0021 0000 0000 0000 2c78 0024 0002 438a 45c4 46d8 aa34 aab4 0000 a424 0008 aa34 af34 723c aa34 9d2c
1514460  af34 723c 0006 7170 5f70 6f77 000e 0d35 0006 636c 5f70 6f77 000e 81e6 000e 8248 000a 3420 000c 08bc 0300 4d07 0000 4b77
1514540  0000 000c 000f 5198 000f 5198 0021 0000 0000 0000 0008 da0c 0300 4d0f 0000 4b77 0000 000c 000f 4ee4 000f 4ee4 0021 0000
1514620  0000 0000 0006 5149 636f 6e76 000e 3e4c 0014 7265 7072 6573 656e 7461 7469 6f6e 5f66 6175 6c74 0088 0000 4e07 b328 ac90
1514700  000c f330 0000 0000 000d 7c78 0400 4d17 0000 4b77 0000 0010 000f 51f8 000f 51f8 0021 0000 0000 0000 000c 09bc 0300 4d1f
1514760  0000 4b77 0000 000c 000e 65d8 000e 65d8 0001 0059 0000 0000 0006 5149 7061 7274 000e 3e7c 0006 5146 6a6f 696e 000e 3e88
1515040  0009 7265 6164 636f 6e73 7400 000c 094c 0500 4127 0000 4b77 0000 0014 000e 87ac 000e 87ac 0021 0000 0000 0000 000c 0a0c
1515120  0500 4d2f 0000 4b77 0000 0014 000f 525c 000f 525c 0021 0000 0000 0000 0006 5146 636f 6e76 000e 0db9 0000 4db7 b328 0e3d
1515200  000c f304 0000 0000 2c78 001c 0002 438a 3640 35c8 4240 0000 ffff fffb 239c 0000 000e 8344 000a af64 0300 4d37 0000 4b77
1515260  000f 000c 000f 5218 000f 5218 0021 0000 0000 0000 0006 5146 7061 7274 0000 0ad7 b464 d704 000b b47c 0000 0000 0008 daac
1515340  0400 4d3f 0000 4b77 0000 0010 000f 5238 000f 5238 0021 0000 0000 0000 0000 4ddf b328 23ff 000c f298 0000 0000 29c8 9a28
```

| | | | | | | | | | | | | | | | | | | | | | | | | |
|---|---|---|---|---|---|---|---|---|---|---|---|---|---|---|---|---|---|---|---|---|---|---|---|---|
| 1515420 | 000f | 9a18 | 0010 | e0e2 | 0000 | 4ddf | b328 | 3ee0 | 000c | f26c | 0000 | 0000 | 2c78 | 001c | 0002 | 438a | 3640 | 35c8 | 4240 | 0000 | 0000 | 0003 | 239c | 0000 |
| 1515500 | 000e | 8344 | 0009 | 616c | 7068 | 615f | 6e75 | 6d00 | 000a | 735f | 7665 | 7274 | 6963 | 6573 | 0000 | 0000 | b464 | 5d88 | 000c | faac | 0000 | 0000 | 000a | 705f |
| 1515560 | 7665 | 7274 | 6963 | 6573 | 0000 | 0000 | 2c78 | 001c | 0002 | 438a | 3640 | 35c8 | 4240 | 0000 | 0000 | 000b | 239c | 0000 | 000e | 8344 | 0009 | 6f72 | 645f | 7365 |
| 1515640 | 7465 | 7100 | 000b | 735f | 7472 | 616e | 7370 | 6f73 | 6500 | 0000 | 000b | e014 | 0000 | 0000 | 0002 | 6964 | 000e | 866c | 0007 | 6f72 | 6473 | 6574 | 7300 | 0000 |
| 1515720 | 000b | 705f | 7472 | 616e | 7370 | 6f73 | 6500 | 000c | 2c78 | 001c | 0002 | 438a | 3640 | 35c8 | 4240 | 0000 | 0000 | 0013 | 239c | 0000 | 000e | 8344 | 0008 | 746f |
| 1516000 | 705f | 736f | 7274 | 0000 | 0006 | 5146 | 6465 | 6364 | 000e | 84a6 | 0006 | 5146 | 656e | 6364 | 000e | 1495 | 000c | 735f | 746f | 5f70 | 5f74 | 7261 | 6e73 | 0000 |
| 1516060 | 0008 | dacc | 0500 | 4d4f | 0000 | 4b77 | 0000 | 0014 | 000f | 52ac | 000f | 52ac | 0021 | 0000 | 0000 | 0000 | 000c | 2120 | 476f | 616c | 3a20 | 7e71 | 7e6e | 00a5 |
| 1516140 | 0013 | 2120 | 5472 | 7920 | 696e | 7374 | 6561 | 643a | 207e | 717e | 6e00 | 176d | 000c | 735f | 746f | 5f70 | 5f67 | 7261 | 7068 | 0000 | 0003 | 6d73 | 7400 | 0000 |
| 1516220 | 000e | 8170 | 000a | 3450 | 000c | 705f | 746f | 5f66 | 5f67 | 7261 | 7068 | 00fc | 000c | 735f | 746f | 5f66 | 5f67 | 7261 | 7068 | 0000 | 2c78 | 0010 | 0002 | 438a |
| 1516300 | 239c | 0000 | 000e | 7e58 | 0007 | 636f | 6d70 | 6c65 | 7800 | 8566 | 000c | 705f | 746f | 5f73 | 5f67 | 7261 | 7068 | 0000 | 0004 | 7768 | 656e | 0000 | 2c78 | 001c |
| 1516360 | 0002 | 438a | 5d10 | 0000 | 0200 | 4d6f | 60cc | 3640 | 3600 | 22bc | 000e | 76a0 | 2cac | 859e | 0002 | 438a | 2ca0 | 85a6 | 0000 | 0000 | 0000 | 0001 | 000e | 857c |
| 1516440 | 000e | 857c | 0002 | 438a | 000e | 72cc | 0006 | 6d61 | 7468 | 2e6f | 000e | 1d9d | 0005 | 6c64 | 6578 | 7000 | 0006 | 5146 | 726d | 6472 | 000e | 85de | 000e | 6e78 |
| 1516520 | 0200 | 22df | 0000 | 4b77 | 0000 | 0008 | 000a | 18f0 | 000a | 18f0 | 0000 | 0000 | 0000 | 0000 | 000c | 665f | 746f | 5f73 | 5f67 | 7261 | 7068 | 0000 | 0000 | 0000 |
| 1516600 | 0000 | 0028 | 2ca0 | 2031 | 0000 | 0000 | 0000 | 0001 | 000e | 6840 | 000e | 6840 | 0002 | 438a | 000e | 8630 | 0015 | 85dc | 000e | 6f44 | 0200 | 22d7 | 0000 | 4b77 |
| 1516660 | 0000 | 0008 | 000a | 18f0 | 000a | 18f0 | 0000 | 0000 | 0000 | 0000 | 000c | 665f | 746f | 5f70 | 5f67 | 7261 | 7068 | 0000 | 0007 | 5170 | 4368 | 6172 | 7300 | 80c0 |
| 1516740 | 0012 | f100 | 000e | 6f08 | 0000 | 0024 | 2ca0 | 2389 | 0000 | 00fc | 0000 | 0026 | 000e | 69c4 | 000b | 2f24 | 0002 | 438a | 000b | 2cec | 000f | 8708 | 0005 | 5150 |
| 1517020 | 5f4c | 3400 | 0000 | 4b97 | b328 | 6a90 | 000b | 302c | 0000 | 0000 | 0003 | 2d6c | 6d00 | 0000 | 0015 | 3138 | 000f | 4c50 | 000e | 72ac | 0000 | 0010 | 000f | 52f8 |
| 1517100 | 000c | 0008 | 000b | dc54 | 0000 | 0000 | 000e | 8634 | 0300 | 22d7 | 0000 | 4b77 | 0000 | 000c | 000a | 18f0 | 000a | 18f0 | 0000 | 0000 | 0000 | 0000 | 0000 | 002c |
| 1517160 | 000a | d3e4 | b27c | b66c | 0000 | 0521 | 7fff | ffff | 000e | 8730 | 0200 | 0db5 | 0200 | 22ed | 0000 | 4b9f | 0077 | 1543 | 0000 | 315f | 0000 | 002c | 000e | 8704 |
| 1517240 | b27c | b66c | 0000 | 0522 | 7fff | ffff | 000d | 18b8 | 0200 | 0db5 | 0200 | 22ed | 0000 | 2727 | 0076 | a443 | 0000 | 315f | 0000 | 002c | 000b | 32c4 | b27c | b66c |
| 1517320 | 0000 | 0533 | 7fff | ffff | 000e | 8788 | 0200 | 0db5 | 0200 | 22ed | 0000 | 4c37 | 0075 | 3343 | 0000 | 315f | 0000 | 002c | 000e | 875c | b27c | b66c | 0000 | 0534 |
| 1517400 | 7fff | ffff | 000b | 33f0 | 0200 | 0db5 | 0200 | 22ed | 0000 | 4c57 | 0076 | 86c3 | 0000 | 315f | 2c78 | 0028 | 0002 | 438a | 7ae4 | 0008 | 7ed4 | 7ed4 | 8264 | 8124 |
| 1517460 | 7ebc | 0000 | 000e | 9318 | 0014 | 8924 | 0018 | 88e4 | 8ab8 | 228c | 0000 | 002c | 000d | 18b8 | b27c | b66c | 0000 | 0524 | 7fff | ffff | 000b | 3088 | 0200 | 0db5 |
| 1517540 | 0200 | 22ed | 0000 | 4baf | 0074 | c523 | 0000 | 315f | 9de3 | bfb0 | f027 | a044 | fd07 | a044 | f227 | a048 | ff07 | a048 | 8090 | 001a | 3680 | 000a | 8090 | 001a |
| 1517620 | 1100 | 03c9 | c11a | 21f0 | 85a0 | 09de | 85a0 | 0022 | b420 | 001a | bfa0 | 0023 | bda0 | 0022 | 8090 | 001a | 3280 | 0007 | 808e | a001 | 1500 | 03c9 | c91a | a1f0 |
| 1517700 | bfa0 | 0025 | 1080 | 001e | bda0 | 0024 | 3280 | 0008 | b9a0 | 003e | bda7 | 895e | b53e | a001 | 808e | a001 | 22bf | fffe | bda7 | 895e | b9a0 | 003e | bba0 | 003f |
| 1517760 | b426 | a001 | 8090 | 001a | 2480 | 0010 | bda0 | 003c | 808e | a001 | 3280 | 0008 | b9a7 | 095e | bda7 | 895e | b53e | a001 | 808e | a001 | 22bf | fffe | bda7 | 895e |
| 1520040 | b9a7 | 095e | b426 | a001 | 8090 | 001a | 34bf | fffb | 908e | a001 | bda0 | 003c | bfa0 | 003d | 81a0 | 003e | 83a0 | 003f | 81c7 | e008 | 81e8 | 0000 | 9de3 | bf80 |
| 1520120 | f027 | a044 | c507 | a044 | f227 | a048 | c707 | a048 | 1100 | 03c9 | c11a | 21f8 | 81a8 | 8ac0 | 0100 | 0000 | 1980 | 0006 | ba10 | 2000 | c907 | a044 | 89a0 | 00a4 |
| 1520200 | c927 | a044 | ba10 | 2001 | d107 | a044 | d307 | a048 | 1300 | 03c9 | cd1a | 6200 | 81aa | 0ac6 | 0100 | 0000 | 0780 | 0036 | d907 | a044 | db07 | a048 | 1500 | 03c9 |
| 1520260 | d51a | a208 | 81ab | 0aca | 0100 | 0000 | 0780 | 000a | d007 | a044 | 4000 | 12cd | 9210 | 0019 | 1700 | 03c9 | dd1a | e210 | a1a0 | 084e | e327 | a048 | 1080 | 005c |
| 1520340 | e127 | a044 | 4c00 | 12c5 | 9210 | 0019 | c13b | a060 | eb07 | a048 | e907 | a044 | e707 | a048 | e507 | a044 | ada4 | 8954 | 2100 | 03c9 | f11c | 2200 | f91c | 2200 |
| 1520420 | b5a6 | 09d6 | b5a0 | 003a | bda6 | 885c | f123 | a068 | d003 | a068 | ff23 | a068 | 4000 | 1fb8 | d203 | a068 | c51c | 2200 | 89a0 | 0842 | c923 | a06c | d003 | a06c |
| 1520500 | cb23 | a06c | 4000 | 12ad | d203 | a06c | cd1b | a060 | 91a0 | 0846 | 8090 | 001d | d327 | a048 | 0280 | 003f | d127 | a044 | ed07 | a044 | ef07 | a048 | ada0 | 00b6 |
| 1520560 | 1080 | 003d | ed3f | bff0 | db07 | a048 | 1f00 | 03c9 | d51b | e218 | 81ab | 0aca | 0100 | 0000 | 3980 | 001a | d107 | a044 | dd07 | a044 | df07 | a048 | e107 | a044 |
| 1520640 | e307 | a048 | a5a3 | 8950 | cd07 | a044 | cf07 | a048 | 2100 | 03c9 | 2300 | 03c9 | 2500 | 03c9 | e53f | bff8 | e91c | 2220 | ed1f | bff8 | b1a5 | 0956 | f51c | 6228 |
| 1520720 | f41f | bff8 | c51c | a200 | b9a6 | 88d8 | 81a7 | 895c | 89a0 | 88c0 | 8da1 | 8944 | cf27 | a048 | 1080 | 0018 | cd27 | a044 | d307 | a048 | d507 | a044 | d707 | a048 |
| 1521000 | 99a2 | 094a | 2700 | 03c9 | dd1c | e200 | a1a3 | 084e | e123 | a060 | d003 | a060 | e323 | a060 | 4000 | 1f7b | d203 | a060 | e707 | a048 | e507 | a044 | a9a0 | 0852 |
| 1521060 | e923 | a064 | d003 | a064 | eb23 | a064 | 4000 | 126f | d203 | a064 | c327 | a048 | c127 | a044 | 8090 | 001d | 32bf | ffc6 | ed07 | a044 | f107 | a044 | f307 | a048 |
| 1521140 | f13f | bff0 | c11f | bff0 | 81c7 | e008 | 81e8 | 0000 | 9de3 | bf88 | f027 | a044 | c507 | a044 | f227 | a048 | c707 | a048 | 1100 | 03c9 | c11a | 2230 | 81a8 | 8ac0 |
| 1521220 | 0100 | 0000 | 3980 | 0006 | d107 | a044 | 1300 | 03c9 | c91a | 6238 | 1080 | 0030 | c93f | bff8 | d307 | a048 | 1500 | 03c9 | cd1a | a240 | 81aa | 0ac6 | 0100 | 0000 |
| 1521300 | 2780 | 000a | e107 | a044 | 9210 | 0019 | 4000 | 124b | 9010 | 0018 | 1700 | 03c9 | d51a | e248 | 99a0 | 084a | 1080 | 0021 | d93f | bff8 | e307 | a048 | 2100 | 03c9 |
| 1521360 | dd1c | 2230 | a5a4 | 08ce | e523 | a060 | d003 | a060 | e723 | a060 | 4000 | 1f41 | d203 | a060 | c13f | bff0 | ef07 | a048 | ed07 | a044 | e91c | 2230 | b1a5 | 8854 |
| 1521440 | f123 | a060 | d003 | a060 | f323 | a060 | 4000 | 1f37 | d203 | a060 | f51f | bff0 | b9a0 | 085a | fd1f | bff0 | c51c | 2230 | 81a7 | 095e | 89a0 | 0842 | c923 | a064 |
| 1521520 | d003 | a064 | cb23 | a064 | 4000 | 1228 | d203 | a064 | c13f | bff8 | c11f | bff8 | 81c7 | e008 | 81e8 | 0000 | 9de3 | bf88 | f027 | a044 | fd07 | a044 | f227 | a048 |
| 1521600 | ff07 | a048 | 1100 | 03c9 | c11a | 2250 | 81af | 8ac0 | 0100 | 0000 | 1980 | 0008 | ba10 | 2000 | 85a0 | 003e | 87a0 | 003f | 85a0 | 00a2 | bfa0 | 0023 | bda0 | 0022 |
| 1521660 | ba10 | 2001 | 1300 | 03c9 | c91a | 6258 | 81af | 8ac4 | 0100 | 0000 | 2b80 | 0018 | 1f00 | 03c9 | 1500 | 03c9 | cd1a | a260 | 81af | 8ac6 | 0100 | 0000 | 3d80 | 0040 |
| 1521740 | 8090 | 001d | 91a7 | 895e | 1700 | 03c9 | 1900 | 03c9 | 1b00 | 03c9 | d13f | bff8 | d51a | e268 | d91f | bff8 | 9da3 | 094a | e11b | 2270 | e91f | bff8 | f11b | 6278 |
| 1522020 | a5a3 | 8850 | ada4 | 8954 | b5a5 | 8858 | 1080 | 002f | bda7 | 895a | f91b | e278 | 81af | 8adc | 0100 | 0000 | 2780 | 0009 | 1100 | 03c9 | fd23 | a060 | ff23 | a064 |
| 1522100 | 4000 | 0276 | 0100 | 0000 | bfa0 | 0021 | 1080 | 0023 | bda0 | 0020 | c11a | 2278 | 85a0 | 085e | 2500 | 03c9 | c91a | 2278 | d51c | a250 | 8da1 | 08de | 91a1 | 89c2 |
| 1522160 | 91a0 | 0028 | bfa0 | 0029 | bda0 | 0028 | 81af | 8a4a | 0100 | 0000 | 2380 | 0009 | fd3b | a068 | fd23 | a060 | ff23 | a064 | 4060 | 0261 | 0100 | 0000 | bfa0 | 0021 |
| 1522240 | 1080 | 000c | bda0 | 0020 | d003 | a068 | d203 | a06c | fd23 | a060 | ff23 | a064 | 4000 | 11d0 | 2700 | 03c9 | d91c | e280 | 9da0 | 094c | bfa0 | 002f | bda0 | 002e |
| 1522320 | bda0 | 003e | bfa0 | 003f | 8090 | 001d | 2280 | 0008 | bda0 | 003e | a1a0 | 003e | a3a0 | 003f | a1a0 | 00b0 | bfa0 | 0031 | 1080 | 0003 | bda0 | 0030 | bfa0 | 003f |
| 1522400 | 81a0 | 003e | 83a0 | 003f | 81c7 | e008 | 81e8 | 0000 | 9de3 | bf90 | f027 | a044 | f227 | a048 | f427 | a04c | f627 | a050 | 9010 | 0018 | 9210 | 0019 | 9410 | 001a |
| 1522460 | 4000 | 0dda | 9610 | 001b | c13f | bff8 | c11f | bff8 | 81c7 | e008 | 81c8 | 0000 | 9de3 | bf90 | b026 | 3fff | 80a6 | 2003 | f427 | a04c | f227 | a048 | 1880 | 0028 |

| | | | | | | | | | | | | | | | | | | | | | | | | |
|---|---|---|---|---|---|---|---|---|---|---|---|---|---|---|---|---|---|---|---|---|---|---|---|---|
| 1522540 | b12e | 2002 | 1300 | 03a3 | 9212 | 6208 | d006 | 0009 | 81c2 | 0000 | 0100 | 0000 | 000e | 8e18 | 000e | 8e40 | 000e | 8e2c | 000e | 8e5c | 9210 | 001a | 4000 | 2404 |
| 1522620 | 9010 | 0019 | 1080 | 001a | c13f | bff8 | 9210 | 001a | 4000 | 2415 | 9010 | 0019 | 1080 | 0015 | c13f | bff8 | 9210 | 001a | 9010 | 0019 | 4000 | 025c | 9407 | a048 |
| 1522700 | c11f | a048 | 1080 | 000e | c13f | bff8 | 1500 | 03c9 | c51a | a288 | c523 | a060 | d403 | a060 | c723 | a060 | d603 | a060 | 9210 | 001a | 4000 | 0dac | 9010 | 0019 |
| 1522760 | c91f | a048 | 8da1 | 08c0 | cd3f | bff8 | c11f | bff8 | 81c7 | e008 | 81e8 | 0000 | 9de3 | bf88 | b026 | 3fff | 80a6 | 2003 | f427 | a04c | f227 | a048 | 1880 | 0031 |
| 1523040 | b12e | 2002 | 1300 | 03a3 | 9212 | 62c8 | d006 | 0009 | 81c2 | 0000 | 0100 | 0000 | 000e | 8ed8 | 000e | 8f20 | 000e | 8efc | 000e | 8f38 | 9210 | 001a | 4000 | 23d4 |
| 1523120 | 9010 | 0019 | c13f | bff0 | c51f | bff0 | c11f | a048 | 89a0 | 08c2 | 1080 | 001f | c93f | bff8 | 9210 | 001a | 4000 | 23e1 | 9010 | 0019 | c13f | bff0 | cd1f | a048 |
| 1523200 | d11f | bff0 | 95a1 | 88c8 | 1080 | 0016 | d53f | bff8 | 9210 | 001a | 9010 | 0019 | 4000 | 0224 | 9407 | bff0 | 1080 | 0010 | c13f | bff8 | 1500 | 03c9 | d91a | a290 |
| 1523260 | d923 | a060 | d403 | a060 | db23 | a060 | d603 | a060 | 9210 | 001a | 4000 | 0d75 | 9010 | 0019 | c13f | bff8 | dd1f | a048 | e11f | bff8 | a5a3 | 88d0 | e53f | bff0 |
| 1523340 | e91f | bff8 | aba0 | 18d4 | eb27 | 0009 | ed1f | bff0 | afa0 | 18d6 | ef26 | c000 | 81c7 | e008 | 81e8 | 0000 | 9de3 | bf90 | f427 | a04c | f627 | a050 | f827 | a054 |
| 1523420 | fa27 | a058 | 9407 | bff8 | 9010 | 001a | 4000 | 0203 | 9210 | 001b | 1100 | 03c9 | c51a | 2298 | 81a8 | 0a42 | 0100 | 0000 | 3380 | 0085 | b026 | 3fff | 1080 | 0090 |
| 1523500 | b210 | 2000 | cd07 | a054 | cf07 | a058 | 1300 | 03c9 | c91a | 6298 | 81a9 | 8ac4 | 0100 | 0000 | 2980 | 0088 | b210 | 2000 | d507 | a054 | d707 | a058 | 1500 | 03c9 |
| 1523560 | d11a | a2a0 | 81aa | 8ac8 | 0100 | 0000 | 3780 | 0090 | b210 | 2000 | d907 | a04c | db07 | a050 | dd07 | a054 | df07 | a058 | a1a3 | 084e | a3a0 | 18d0 | e326 | 4000 |
| 1523640 | 10c0 | 0077 | b210 | 2001 | e907 | a054 | eb07 | a058 | 1700 | 03c9 | e51a | e298 | 81ad | 0ad2 | 0100 | 0000 | 2d80 | 006f | b210 | 2000 | f107 | a054 | f307 | a058 |
| 1523720 | 1900 | 03c9 | ed1b | 22a8 | 81ae | 0ad6 | 0100 | 0000 | 3b80 | 0067 | b210 | 2000 | f507 | a04c | f707 | a050 | f907 | a054 | fb07 | a058 | bda6 | 885c | bfa0 | 18de |
| 1524000 | ff26 | 4000 | 1080 | 005e | b210 | 2001 | c507 | a054 | c707 | a058 | 1b00 | 03c9 | c11b | 62a8 | 81a8 | 8ac0 | 0100 | 0000 | 3b80 | 0056 | b210 | 2000 | cd07 | a054 |
| 1524060 | cf07 | a058 | 1f00 | 03c9 | c91b | e2a0 | 91a9 | 8ac4 | 0100 | 0000 | 3780 | 004e | b210 | 2000 | d107 | a04c | d307 | a050 | d507 | a054 | d707 | a058 | 99a2 | 084a |
| 1524140 | 9407 | a04c | d93f | bff8 | d007 | bff8 | 4000 | 01af | d207 | bffc | df07 | a058 | dd07 | a054 | 81a8 | 0a4e | 0100 | 0000 | 2380 | 003e | b210 | 2000 | e11f | bff8 |
| 1524220 | a3a0 | 18d0 | e326 | 4000 | 1080 | 0039 | b210 | 2001 | e907 | a054 | eb07 | a058 | 2100 | 03c9 | e51c | 22b0 | 81ad | 0ad2 | 0100 | 0000 | 2980 | 0031 | b210 | 2000 |
| 1524300 | f107 | a054 | f307 | a058 | 2300 | 03c9 | ed1c | 62b8 | 81ae | 0ad6 | 0100 | 0000 | 2d80 | 0029 | b210 | 2000 | f507 | a04c | f707 | a050 | f907 | a054 | fb07 | a058 |
| 1524360 | bda6 | 885c | 1500 | 03c9 | fd3f | bff8 | c11a | a2a0 | c123 | a060 | d403 | a060 | c323 | a060 | d603 | a060 | d007 | bff8 | 4000 | 0ce1 | d207 | bffc | c707 | a058 |
| 1524440 | c507 | a054 | 81a8 | 0a42 | 0100 | 0000 | 2380 | 0014 | b210 | 2000 | c91f | bff8 | 8ba0 | 18c4 | cb26 | 4000 | 1080 | 000f | b210 | 2001 | 80a6 | 2003 | 1880 | 000b |
| 1524520 | b12e | 2002 | 1300 | 03a4 | 9212 | 61f8 | d006 | 0009 | 81c2 | 0000 | 0100 | 0000 | 000e | 8fd4 | 000e | 909c | 000e | 9038 | 000e | 9130 | b210 | 2000 | 81c7 | e008 |
| 1524600 | 91e8 | 0019 | 9de3 | bf90 | b026 | 3fff | 80a6 | 2003 | f427 | a04c | f227 | a048 | 1880 | 0027 | b12e | 2002 | 1300 | 03a4 | 9212 | 6244 | d006 | 0009 | 81c2 | 0000 |
| 1524660 | 0100 | 0000 | 000e | 9254 | 000e | 927c | 000e | 9268 | 000e | 9294 | 9210 | 001a | 4000 | 22f5 | 9010 | 0019 | 1080 | 0019 | c13f | bff8 | 9210 | 001a | 4000 | 2306 |
| 1524740 | 9010 | 0019 | 1080 | 0014 | c13f | bff8 | 9210 | 001a | 9010 | 0019 | 4000 | 014d | 9407 | bff8 | 1080 | 000f | cd1f | bff8 | 1500 | 03c9 | c11a | a2c0 | c123 | a060 |
| 1525020 | d403 | a060 | c323 | a060 | d603 | a060 | 9210 | 001a | 4000 | 0c9e | 9010 | 0019 | c51f | a048 | 89a0 | 88c0 | c93f | bff8 | cd1f | bff8 | 1100 | 03c9 | d11a | 21e0 |
| 1525100 | 81a9 | 8ac8 | 0100 | 0000 | 0980 | 0009 | 0100 | 0000 | d51f | bff8 | 1300 | 03c9 | d91a | 61e8 | 81aa | 8acc | 0100 | 0000 | 3d80 | 0004 | dd1f | bff8 | 1080 | 0005 |
| 1525160 | b010 | 2000 | 9fa0 | 1a4e | b010 | 2001 | df26 | c000 | 81c7 | e008 | 81e8 | 0000 | 9de3 | bf88 | b026 | 3fff | 80a6 | 2003 | f427 | a04c | f227 | a048 | 1880 | 0031 |
| 1525240 | b12e | 2002 | 1300 | 03a4 | 9212 | 6348 | d006 | 0009 | 81c2 | 0000 | 0100 | 0000 | 000e | 9358 | 000e | 93ac | 000e | 937c | 000e | 93b8 | 9210 | 001a | 4000 | 22b4 |
| 1525320 | 9010 | 0019 | c13f | bff0 | c51f | bff0 | c11f | a048 | 99a0 | 08c2 | 1080 | 001f | c93f | bff8 | 9210 | 001a | 4000 | 22c1 | 9010 | 0019 | c13f | bff0 | cd1f | a048 |
| 1525400 | d11f | bff0 | 95a1 | 88c8 | 1080 | 0016 | d53f | bff8 | 9210 | 001a | 9010 | 0019 | 4000 | 0104 | 9407 | bff0 | 1080 | 0010 | c13f | bff8 | 1500 | 03c9 | d91a | a2c8 |
| 1525460 | d923 | a060 | d403 | a060 | db23 | a060 | d603 | a060 | 9210 | 001a | 4000 | 0c55 | 9010 | 0019 | c13f | bff8 | dd1f | a048 | e11f | bff8 | a5a3 | 88d0 | e53f | bff0 |
| 1525540 | e91f | bff0 | 1100 | 03c9 | ed1a | 21e0 | 81ad | 0ad6 | 0100 | 0000 | 0980 | 0009 | 0100 | 0000 | f11f | bff0 | 1300 | 03c9 | f51a | 61e8 | 81ae | 0a3a | 0100 | 0000 |
| 1525620 | 3d80 | 0004 | f91f | bff8 | 10d0 | 0008 | b010 | 2000 | bba0 | 18dc | b010 | 2001 | fb27 | 0000 | fd1f | bff0 | bfa0 | 1a5e | ff26 | c000 | 81c7 | e008 | 81e8 | 0000 |
| 1525700 | 9de3 | bf98 | f027 | a044 | c107 | a044 | f227 | a048 | c307 | a048 | c13f | bff8 | d007 | bff8 | 1320 | 0000 | 808a | 0009 | 2280 | 0003 | ba10 | 2001 | ba10 | 3fff |
| 1525760 | fa26 | 8000 | d007 | bff8 | d207 | bffc | 151f | ffff | 9412 | a3ff | 900a | 000a | d027 | bff8 | 4000 | 004d | 9410 | 001c | 83a0 | 18c0 | c326 | c000 | 81c7 | e008 |
| 1526040 | 81e8 | 0000 | 9de3 | bf90 | 80a6 | 6001 | f627 | a050 | 0280 | 0007 | f427 | a04c | 80a6 | 7fff | 2280 | 0005 | fd07 | a04c | 1080 | 0035 | b210 | 2000 | fd07 | a04c |
| 1526120 | ffc7 | a050 | 1100 | 03c9 | c11a | 22d0 | 81af | 8ac0 | 0100 | 0000 | 1780 | 000f | 1300 | 03c9 | c51a | 62d8 | 81af | 8ac2 | 0100 | 0000 | 3980 | 000c | 2100 | 0295 |
| 1526200 | 1500 | 03c9 | c91a | a2e0 | 81af | 8a44 | 0100 | 0000 | 0380 | 0004 | 8090 | 001c | 2280 | 0004 | 2100 | 0295 | 1080 | 001e | b210 | 2000 | c024 | 21c8 | fd3b | a068 |
| 1526260 | d003 | a068 | d203 | a06c | fd23 | a060 | ff23 | a064 | 4000 | 0066 | 9410 | 001c | bfa0 | 0021 | bda0 | 0020 | e004 | 21c8 | 8090 | 0010 | 2280 | 0004 | 8090 | 0019 |
| 1526340 | 1080 | 000e | b210 | 2002 | 3680 | 0008 | b1a0 | 003e | 8da0 | 003e | 8fa0 | 003f | 8da0 | 00a6 | bfa0 | 0027 | 1080 | 0003 | bda0 | 0026 | bfa0 | 003f | 8fa0 | 18de |
| 1526420 | b210 | 2001 | cf26 | 0000 | 81c7 | e008 | 91e8 | 0019 | 1700 | 03c9 | 9612 | e308 | d222 | e004 | d022 | c000 | c11a | c000 | 81c3 | e008 | 81a0 | 0120 | 0000 | 0000 |
| 1526500 | 9de3 | bf98 | f027 | a044 | 131f | fc00 | b00e | 0009 | 80a6 | 0009 | 9010 | 2001 | 1280 | 0003 | f227 | a048 | 9010 | 2000 | 8090 | 0008 | 2280 | 000f | c026 | 8000 |
| 1526560 | c507 | a044 | c707 | a048 | 1100 | 03c9 | c11a | 2310 | 81a8 | 8a40 | 0100 | 0000 | 3380 | 0007 | c026 | 8000 | d207 | a048 | 4000 | 1a9e | d007 | a044 | 9002 | 2001 |
| 1526640 | d026 | 8000 | d406 | 8000 | d207 | a048 | d007 | a044 | 4000 | 1afb | 9420 | 000a | c13f | bff8 | c11f | bff8 | 81c7 | e008 | 81e8 | 0000 | 1100 | 03c9 | fd1a | 23b0 |
| 1526720 | 83a0 | 003f | 81c3 | e008 | 81a0 | 003e | 1100 | 03c9 | fd1a | 23c0 | 83a0 | 003f | 81c3 | e008 | 81a0 | 003e | 1100 | 03c9 | fd1a | 23b8 | 83a0 | 003f | 81c3 | e008 |
| 1527000 | 81a0 | 003e | 1100 | 03c9 | fd1a | 23a8 | 83a0 | 003f | 81c3 | e008 | 81a0 | 003e | 1100 | 03c9 | fd1a | 2370 | 83a0 | 003f | 81c3 | e008 | 81a0 | 003e | 1100 | 03c9 |
| 1527060 | fd1a | 2360 | 83a0 | 003f | 81c3 | e008 | 81a0 | 003e | 1100 | 03c9 | fd1a | 2368 | 83a0 | 003f | 81c3 | e008 | 81a0 | 003e | 0000 | 0000 | 9de3 | bfa0 | f027 | a044 |
| 1527140 | 131f | fc00 | b00e | 0009 | 80a6 | 0009 | 9010 | 2001 | 1280 | 0003 | f227 | a048 | 9010 | 2000 | 8090 | 0008 | 2280 | 0026 | c107 | a044 | c507 | a044 | c707 | a048 |
| 1527220 | 1100 | 03ca | c11a | 2000 | 81a8 | 8a40 | 0100 | 0000 | 3380 | 001e | c107 | a044 | d207 | a048 | d007 | a044 | 4000 | 1abb | 9410 | 001a | c127 | a044 | c327 | a048 |
| 1527300 | d007 | a044 | 131f | fc00 | 900a | 0009 | 80a2 | 0009 | 1280 | 0003 | 9010 | 2001 | 9010 | 2000 | 8090 | 0008 | 2280 | 000b | 1700 | 0295 | cd07 | a044 | cf07 | a048 |
| 1527360 | 1300 | 03ca | c91a | 6000 | 81a9 | 8a44 | 0100 | 0000 | 2380 | 0006 | c107 | a044 | 1700 | 0295 | 9410 | 2022 | d422 | e1c8 | c107 | a044 | c307 | a048 | 81c7 | e008 |
| 1527440 | 81e8 | 0000 | 0000 | 0000 | 9de3 | bf88 | f027 | a044 | f227 | a048 | 9010 | 0018 | 4000 | 2181 | 9210 | 0019 | c126 | 8000 | c326 | a004 | d007 | a044 | 131f | fc00 |
| 1527520 | 900a | 0009 | 80a2 | 0009 | 1280 | 0003 | 9010 | 2001 | 9010 | 2000 | 8090 | 0008 | 2280 | 0012 | 1100 | 03ca | c106 | 8000 | c306 | a004 | c13f | bff0 | c507 | a044 |
| 1527600 | c707 | a048 | c91f | bff0 | 81a8 | 8a44 | 0100 | 0000 | 3380 | 0008 | 1100 | 03ca | cd07 | a044 | cf07 | a048 | d11f | bff0 | 95a1 | 88c8 | 1080 | 0011 | d53f | bff8 |

| | | | | | | | | | | | | | | | | | | | | | | | | |
|---|---|---|---|---|---|---|---|---|---|---|---|---|---|---|---|---|---|---|---|---|---|---|---|---|
| 1527660 | d91a | 2028 | d923 | a060 | d003 | a060 | db23 | a060 | 4203 | a060 | d407 | a044 | d223 | a048 | c303 | a048 | 1320 | 0000 | 940a | 8009 | 902a | 0009 | 9012 | 000a |
| 1527740 | d023 | a044 | c103 | a044 | c13f | bff8 | c11f | bff8 | 81c7 | e008 | 81e8 | 0000 | 9de3 | bfc0 | f027 | a044 | c107 | a044 | f227 | a048 | c307 | a048 | 81c7 | e008 |
| 1530020 | 81e8 | 0000 | 9de3 | bf70 | f427 | a04c | c107 | a04c | f627 | a050 | c307 | a050 | f027 | a044 | f227 | a048 | 1100 | 03ca | c51a | 20f0 | 81a8 | 0a42 | 0100 | 0000 |
| 1530100 | 2380 | 0018 | d107 | a044 | 1300 | 03ca | c91a | 6100 | c93f | bff8 | 1520 | 0000 | 942e | 000a | 9210 | 0019 | 8092 | 8009 | 0280 | 0003 | 9010 | 2001 | 9010 | 2000 |
| 1530160 | 8090 | 0008 | 2280 | 0009 | cd1f | bff8 | 9810 | 2014 | 9610 | 001b | 9410 | 001a | 4000 | 1cac | 9010 | 0018 | c13f | bff8 | cd1f | bff8 | 1080 | 017a | cd3f | bff0 |
| 1530240 | d307 | a048 | d507 | a044 | d707 | a048 | 81aa | 0a4a | 0100 | 0000 | 2380 | 000b | e107 | a044 | d907 | a04c | db07 | a050 | dd07 | a04c | df07 | a050 | 81ab | 0a4e |
| 1530320 | 0100 | 0000 | 3380 | 0009 | ed07 | a04c | e107 | a044 | e307 | a048 | e507 | a04c | e707 | a050 | a9a4 | 0852 | 1080 | 0164 | e93f | bff0 | ef07 | a050 | 1500 | 03ca |
| 1530400 | f11a | a100 | 81ad | 8a58 | 0100 | 0000 | 2380 | 0006 | 131f | fc00 | f507 | a044 | f707 | a048 | 1080 | 0159 | f53f | bff0 | b40e | 8009 | 80a6 | 8009 | 1280 | 0003 |
| 1530460 | 9010 | 2001 | 9010 | 2000 | 8090 | 0008 | 3280 | 0040 | fd07 | a044 | d007 | a044 | d207 | a048 | d023 | a044 | c103 | a044 | 81a0 | 0120 | d223 | a048 | c303 | a048 |
| 1530540 | c13f | bff8 | f91f | bff8 | 1700 | 03ca | fd1a | e100 | 81af | 0a5e | 0100 | 0000 | 2380 | 0009 | cd1f | bff8 | 1100 | 03ca | c51a | 20f0 | c11a | 20f0 | 89a0 | 09c2 |
| 1530620 | 89a0 | 0024 | 1080 | 013b | c93f | bff0 | 1f00 | 03ca | d11b | e100 | 81a9 | 8ac8 | 0100 | 0000 | 3d80 | 0013 | e907 | a04c | d507 | a04c | d707 | a050 | 2100 | 03ca |
| 1530700 | d91c | 20f0 | 81aa | 8acc | 0100 | 0000 | 3d80 | 0006 | 2300 | 03ca | dd07 | a04c | df07 | a050 | 1080 | 0004 | dd3f | bfe8 | e11c | 60f0 | e13f | bfe8 | e51f | bfe8 |
| 1530760 | 1080 | 0124 | e53f | bff0 | eb07 | a050 | 2500 | 03ca | ed1c | a0f0 | 81ad | 0ad6 | 0100 | 0000 | 3980 | 0007 | 2700 | 03ca | f107 | a04c | f307 | a050 | b1a0 | 00b8 |
| 1531040 | 1080 | 0004 | f13f | bfe0 | f51c | e0f0 | f53f | bfe0 | f91f | bfe0 | 1080 | 0113 | f93f | bff0 | ff07 | a048 | 2900 | 03ca | c11d | 20f0 | 81af | 8a40 | 0100 | 0000 |
| 1531120 | 3380 | 001b | c507 | a04c | d007 | a044 | 131f | fc00 | 900a | 0009 | 80a2 | 0009 | 1280 | 0003 | 9010 | 2001 | 9010 | 2000 | 8090 | 0008 | 2280 | 0011 | c507 | a04c |
| 1531200 | f507 | a04c | f707 | a050 | 3900 | 03ca | f91f | 2108 | 81ae | 8a5c | 0100 | 0000 | 2380 | 008a | c907 | a04c | fd07 | a044 | ff07 | a048 | c107 | a044 | c307 | a048 |
| 1531260 | 85a7 | 8940 | 1080 | 00d2 | c53f | bfd8 | c707 | a050 | 2b00 | 03ca | c91d | 60f0 | 81a8 | 8ac4 | 0100 | 0000 | 1980 | 0048 | d007 | a044 | d207 | a048 | d023 | a044 |
| 1531340 | c103 | a044 | 81a0 | 0120 | d223 | a048 | c303 | a048 | 2d00 | 03ca | cd1d | a100 | 91a1 | 89c0 | 91a0 | 0028 | d007 | a044 | 9132 | 201f | 8090 | 0008 | 0280 | 0027 |
| 1531420 | d13f | bfd8 | d207 | a050 | 4000 | 2062 | d007 | a04c | c13f | bff8 | db07 | a050 | d907 | a04c | d51f | bff8 | 81aa | 8a4c | 0100 | 0000 | 2380 | 001d | fd07 | a044 |
| 1531500 | e107 | a04c | e307 | a050 | 1100 | 03ca | dd1a | 2190 | a5a3 | 8950 | 2f00 | 03ca | 3100 | 03ca | e523 | a060 | d003 | a060 | e723 | a060 | 4000 | 208d | d203 | a060 |
| 1531560 | e91d | e198 | ada5 | 0940 | f11f | bff8 | f91e | 2100 | b5a6 | 08d6 | 81ae | 8a5c | 0100 | 0000 | 2380 | 0008 | fd07 | a044 | d207 | bfdc | 7fff | ff18 | d007 | bfd8 |
| 1531640 | 81a0 | 00a0 | c13f | bfd8 | fd07 | a044 | ff07 | a048 | 3300 | 03ca | c11e | 60f0 | 81af | 8a40 | 0100 | 0000 | 2380 | 000a | c51f | bfd8 | d607 | a050 | d407 | a04c |
| 1531720 | d207 | a048 | d007 | a044 | 4000 | 1bd8 | 9810 | 2017 | c13f | bfd8 | c51f | bfd8 | 1080 | 00a6 | c53f | bff0 | d207 | a048 | d023 | a044 | c103 | a044 | 81a0 | 0120 |
| 1532000 | d223 | a048 | c303 | a048 | c13f | bfd8 | d007 | a044 | 9132 | 201f | 8090 | 0008 | 2280 | 0028 | f11f | bfd8 | d207 | a050 | 4000 | 201f | d007 | a04c | c13f | bff8 |
| 1532060 | cf07 | a050 | cd07 | a04c | c91f | bff8 | 81a9 | 0a46 | 0100 | 0000 | 2380 | 001d | f11f | bfd8 | d507 | a04c | d707 | a050 | 1100 | 03ca | d11a | 2190 | 99a2 | 094a |
| 1532140 | 3500 | 03ca | 3700 | 03ca | d923 | a060 | d003 | a060 | db23 | a060 | 4000 | 204a | d203 | a060 | dd1e | a198 | a1a3 | 8940 | e51f | bff8 | ed1e | e100 | a9a4 | 88d0 |
| 1532220 | 81ad | 0a56 | 0100 | 0000 | 2380 | 0008 | f11f | bfd8 | d207 | bfdc | 7fff | fed5 | d007 | bfd8 | 81a0 | 00a0 | c13f | bfd8 | f11f | bfd8 | 1080 | 0072 | f13f | bff0 |
| 1532300 | cb07 | a050 | 3b00 | 03ca | cd1f | 6110 | 81a9 | 0a46 | 0100 | 0000 | 2380 | 000a | d007 | a044 | d507 | a044 | d707 | a048 | 1100 | 03ca | d11a | 2100 | 99a2 | 09ca |
| 1532360 | 99a0 | 002c | 1080 | 0042 | d93f | bfd8 | 9132 | 201f | 8090 | 0008 | 3280 | 0009 | d207 | a050 | d607 | a050 | d407 | a04c | d207 | a048 | 4000 | 005d | d007 | a044 |
| 1532440 | 1080 | 0037 | c13f | bfd8 | 4000 | 1fde | d007 | a04c | c13f | bff8 | e307 | a050 | e107 | a04c | dd1f | bff8 | 81ab | 8a50 | 0100 | 0000 | 2380 | 0026 | d607 | a050 |
| 1532520 | e507 | a044 | e707 | a048 | a5a0 | 00b2 | e523 | a060 | d003 | a060 | e723 | a060 | d407 | a04c | d607 | a050 | 4000 | 0047 | d203 | a060 | c13f | bfd8 | ef07 | a050 |
| 1532600 | ed07 | a04c | 1300 | 03ca | e91a | 6190 | b1a5 | 8954 | f123 | a060 | d003 | a060 | f323 | a060 | 4000 | 2000 | d203 | a060 | fd1f | bff8 | 1500 | 03ca | f51a | a198 |
| 1532660 | b9a6 | 8940 | 1700 | 03ca | c51a | e100 | 81a7 | 88dc | 81a8 | 0a42 | 0100 | 0000 | 2380 | 000e | d007 | bfd8 | c91f | bfd8 | 89a0 | 00a4 | 1080 | 0009 | c93f | bfd8 |
| 1532740 | d407 | a04c | d207 | a048 | d007 | a044 | 4000 | 1b53 | 9810 | 2018 | 1080 | 0023 | c13f | bff0 | d007 | bfd8 | 131f | fc00 | 900a | 0009 | 80a2 | 0009 | 1280 | 0003 |
| 1533020 | 9010 | 2001 | 9010 | 2000 | 8090 | 0008 | 3280 | 000a | d11f | bfd8 | d607 | a050 | d407 | a04c | d207 | a048 | d007 | a044 | 4000 | 1b41 | 9810 | 2015 | c13f | bfd8 |
| 1533100 | d11f | bfd8 | 1900 | 03ca | cd1b | 21a0 | 81aa | 0a46 | 0100 | 0000 | 2380 | 000a | d51f | bfd8 | d607 | a050 | d407 | a04c | d207 | a048 | d007 | a044 | 4000 | 1b33 |
| 1533160 | 9810 | 2016 | c13f | bfd8 | d51f | bfd8 | d53f | bff0 | c11f | bff0 | 81c7 | e008 | 81e8 | 0000 | 9de3 | bf38 | f027 | a044 | c507 | a044 | f227 | a048 | c707 | a048 |
| 1533240 | f427 | a04c | f627 | a050 | 1100 | 03ca | c11a | 21a8 | 81a8 | 8a40 | 0100 | 0000 | 2380 | 0006 | 9210 | 0019 | c907 | a044 | cb07 | a048 | 1080 | 0122 | c93f | bff8 |
| 1533320 | 4000 | 184f | 9010 | 0018 | d207 | a048 | ba10 | 0008 | d007 | a044 | 4000 | 18ae | 9420 | 001d | c13f | bff0 | cd1f | bff0 | 1300 | 03ca | d11a | 60a0 | 81a9 | 8ac8 |
| 1533400 | 0100 | 0000 | 2780 | 0009 | e11f | bff0 | d91f | bff0 | 1500 | 03ca | d51a | a0f8 | 99a3 | 094a | ba07 | 6001 | d93f | bff0 | e11f | bff0 | 1700 | 03ca | dd1a | e100 |
| 1533460 | a1a4 | 0dce | 1900 | 03ca | 1b00 | 03ca | e13f | bff0 | e91f | bff0 | e51b | 2108 | ada4 | 8854 | f11f | bff0 | fd1f | bff0 | f91f | bff0 | 81a7 | 095e | b5a6 | 09d6 |
| 1533540 | b5a0 | 003a | f53f | bfe8 | c51b | 60f8 | d11f | bfe8 | 89a0 | 0942 | cd1f | bfe8 | 95a1 | 8948 | c93f | bfe0 | d523 | a060 | d003 | a060 | d723 | a060 | 4000 | 00f4 |
| 1533620 | d203 | a060 | d91f | bfe0 | 9da3 | 0840 | e11f | bfe8 | e91f | bfe0 | f51f | bff0 | fd1f | bff0 | a5a4 | 094e | c91f | bfe0 | e53f | bfd8 | ed1f | bfd8 | b1a5 | 08d6 |
| 1533700 | d11f | bfd8 | b9a6 | 88d8 | f93f | bfd0 | c11f | bfd0 | 85a7 | 88c0 | 8da0 | 88c4 | 91a2 | 0846 | d13f | bfd8 | fa23 | a060 | d303 | a060 | 95a0 | 1909 | dd1f | bfd0 |
| 1533760 | d53f | bfb8 | d91f | bfb8 | a1a3 | 084e | e123 | a060 | d003 | a060 | e323 | a060 | 4000 | 1801 | d203 | a060 | d207 | a050 | b410 | 0008 | 4000 | 17fd | d007 | a04c |
| 1534040 | 9002 | 001a | 80a2 | 200c | 3680 | 00a3 | f11f | bfd0 | 90a2 | 3fc4 | 2480 | 009d | 2d00 | 03ca | e91f | bfd0 | f11f | bfb8 | f907 | a04c | fb07 | a050 | 2100 | 03ca |
| 1534120 | e51c | 20e8 | ada4 | 8954 | b5a6 | 0856 | b1a7 | 095a | fd3f | bfe8 | d007 | bfe8 | 4000 | 1f7b | d207 | bfec | c307 | a050 | c107 | a04c | 83a0 | 1a40 | b810 | 0008 |
| 1534200 | c323 | a060 | d003 | a060 | d023 | a060 | c503 | a060 | 89a0 | 1902 | cf07 | a050 | cd07 | a04c | 81a9 | 0a46 | 0100 | 0000 | 2380 | 0012 | ed1f | bfb8 | 4000 | 2063 |
| 1534260 | 9210 | 001d | d11f | bfd0 | 93a0 | 18c8 | dd1f | bfd0 | e91f | bfd8 | ba27 | 0008 | d327 | bfcc | d507 | bfcc | 99a0 | 192a | d93f | bfb0 | e11f | bfb0 | a5a3 | 88d0 |
| 1534340 | a9a5 | 0852 | 1080 | 001e | e93f | bfd8 | f91f | bfd8 | fd1f | bfb8 | cd1f | bfd0 | e91f | bfd0 | 2500 | 03ca | f11c | a068 | b5a5 | 8958 | 2700 | 03ca | ba10 | 001c |
| 1534420 | b9a7 | 085a | f93f | bfd8 | c11c | e060 | 85a7 | 8940 | f11f | bfd8 | c53f | bfe0 | c91f | bfe0 | 91a1 | 0846 | dd1f | bfe0 | 93a0 | 18c8 | d327 | bfcc | d507 | bfcc |
| 1534500 | 99a0 | 192a | d93f | bfb0 | e11f | bfb0 | a5a3 | 88d0 | ada4 | 8854 | b1a6 | 0856 | f13f | bfd8 | f507 | a04c | f707 | a050 | b7a0 | 18da | c107 | a04c | c307 | a050 |
| 1534560 | 2900 | 03ca | 2b00 | 03ca | f727 | bfc8 | f907 | bfc8 | bda0 | 193c | fd3f | bfa8 | c51f | bfa8 | 89a0 | 08c2 | c93f | bfc0 | fa23 | a060 | cb03 | a060 | 8da0 | 1905 |
| 1534640 | e11f | bfa8 | dd1f | bfb0 | a5a3 | 8950 | c13f | bfa0 | d51d | 2060 | d11f | bfa0 | fd1f | bfc0 | f91f | bfd8 | 99a2 | 094a | ed1f | bfa0 | c91f | bfa8 | cd1f | bfd8 |
| 1534720 | a9a4 | 88cc | 81a7 | 095e | d51f | bfc0 | d11f | bfb0 | e93f | bfe8 | f11d | 6068 | b5a5 | 8958 | f91f | bfe8 | 95a2 | 8948 | 85a0 | 08da | ed1f | bfe8 | 8da1 | 8944 |

| | | | | | | | | | | | | | | | | |
|---|---|---|---|---|---|---|---|---|---|---|---|---|---|---|---|---|
| 1535000 | d53f | bfc0 | c53f | bff0 | d91f | bfc0 | dd1f | bff0 | a1a3 | 084e | cd3f | bfd8 | e51f | bfd8 | c11f | bfd8 |
| | c91f | bfc0 | d11f | bff0 | e13f | bfd0 | e91f | bfd0 | | | | | | | | |
| 1535060 | a9a5 | 0852 | e93f | bfd0 | f11f | bfd0 | b1a6 | 0856 | f13f | bfd0 | f51f | bfd0 | bda6 | 88dc | d007 | bfd0 |
| | d207 | bfd4 | 85a7 | 89c0 | 8da0 | 88c4 | 95a1 | 88c8 | | | | | | | | |
| 1535140 | 95a0 | 00aa | d53f | bfe0 | d407 | bfe0 | 4000 | 0062 | d607 | bfe4 | d91f | bfd0 | 99a3 | 0840 | 1100 | 03ca |
| | 9410 | 001c | d93f | bfd0 | e11f | bfd0 | dd1a | 2100 | | | | | | | | |
| 1535220 | d5a3 | 8950 | e523 | a060 | d003 | a060 | e723 | a060 | 1080 | 0029 | d203 | a060 | e91d | a100 | 1080 | 0029 |
| | e93f | bff8 | f91f | bfb8 | 1300 | 03ca | 9212 | 6100 | | | | | | | | |
| 1535300 | d002 | 4000 | d202 | 6004 | d407 | a04c | d223 | a048 | c303 | a048 | 1320 | 0000 | 940a | 8009 | 902a | 0009 |
| | 9012 | 000a | d023 | a044 | c103 | a044 | 2f00 | 03ca | | | | | | | | |
| 1535360 | ed1d | e0e8 | b5a5 | 8958 | 3100 | 03ca | c51e | 20f0 | bda7 | 085a | 81a0 | 095e | 81a8 | 0ac2 | 0100 | 0000 |
| | 1980 | 0009 | 1300 | 03ca | 9212 | 6100 | d002 | 4000 | | | | | | | | |
| 1535440 | d202 | 6004 | 153f | fffb | 1080 | 0007 | 9412 | a078 | 9212 | 6100 | d002 | 4000 | d202 | 6004 | 1500 | 0004 |
| | 9412 | a388 | 4000 | 1796 | 0100 | 0000 | c13f | bff8 | | | | | | | | |
| 1535520 | c11f | bff8 | 81c7 | e008 | 81e8 | 0000 | 9de3 | bfb8 | f027 | a044 | fd07 | a044 | f227 | a048 | ff07 | a048 |
| | 1100 | 03ca | c11a | 2148 | 85a7 | 8940 | 1300 | 03ca | | | | | | | | |
| 1535600 | c91a | 6140 | 1500 | 03ca | d51a | a138 | 1700 | 03ca | e11a | e130 | 8da1 | 0842 | 1900 | 03ca | ed1b | 2128 |
| | 1b00 | 03ca | f91b | 6120 | 1f00 | 03ca | 91a7 | 8946 | | | | | | | | |
| 1535660 | c91b | e118 | 99a2 | 8848 | 9da7 | 894c | a5a4 | 084e | a9a7 | 8952 | b1a5 | 8854 | b5a7 | 8958 | 81a7 | 085a |
| | 85a7 | 8940 | 8da1 | 0842 | 91a7 | 8946 | bfa0 | 0029 | | | | | | | | |
| 1535740 | bda0 | 0028 | 83a0 | 003f | 81a0 | 003e | 81c7 | e008 | 81e8 | 0000 | 9de3 | bf60 | f027 | a044 | fd07 | a044 |
| | f227 | a048 | ff07 | a048 | f427 | a04c | f627 | a050 | | | | | | | | |
| 1536020 | fd3b | a068 | d003 | a068 | d203 | a06c | 1700 | 03ca | d602 | e178 | fd23 | a060 | ff23 | a064 | d223 | a048 |
| | c303 | a048 | 1320 | 0000 | 960a | c009 | 902a | 0009 | | | | | | | | |
| 1536100 | 9012 | 000b | d023 | a044 | c103 | a044 | ff03 | a064 | fd03 | a060 | 1100 | 03ca | c51a | 2188 | 81a8 | 0ac2 |
| | 0100 | 0000 | 3180 | 0048 | 1300 | 03ca | 89a7 | 895e | | | | | | | | |
| 1536160 | 1300 | 03ca | 1500 | 03ca | 1700 | 03ca | 1900 | 03ca | 1100 | 03ca | 1f00 | 03ca | c93f | bff8 | d11a | 6158 |
| | cd1f | bff8 | 95a1 | 8948 | d91a | a150 | e11f | bff8 | | | | | | | | |
| 1536240 | e91f | bff8 | c11f | bff8 | 9da3 | 084a | a5a4 | 094e | e53f | bff0 | ed1a | e168 | b1a5 | 0956 | f51b | 2160 |
| | c91f | bff0 | b9a6 | 8858 | 8da7 | 8944 | ed1f | bff0 | | | | | | | | |
| 1536320 | 85a0 | 095c | cd3f | bfe0 | f11f | bff0 | b1a6 | 0856 | dd1f | bfe0 | c53f | bfe8 | d11a | 2180 | 95a7 | 8948 |
| | d91f | bfe8 | a1a3 | 08ce | f13f | bff0 | f91f | bfe0 | | | | | | | | |
| 1536400 | f51f | bff0 | d53f | bfd8 | e51f | bfd8 | a9a4 | 88d0 | c51f | bfe8 | cd1f | bfd8 | ef07 | a050 | ed07 | a04c |
| | 81a6 | 885c | e93f | bfd0 | d11f | bfd0 | 95a1 | 8948 | | | | | | | | |
| 1536460 | e11f | bfd0 | 89a0 | 88c0 | dd1b | e178 | fb07 | a050 | f907 | a04c | 99a2 | 88c4 | c51f | bff8 | a5a3 | 88d0 |
| | c91a | 2180 | 8da0 | 8944 | a9a3 | 09d2 | a9a0 | 0034 | | | | | | | | |
| 1536540 | b1a5 | 0856 | b5a7 | 8958 | 81a7 | 085a | bfa0 | 0021 | bda0 | 0020 | 91a1 | 985e | bfa0 | 0029 | 1080 | 0012 |
| | bda0 | 0028 | 9212 | 6170 | d002 | 4000 | d202 | 6004 | | | | | | | | |
| 1536620 | fd3b | a068 | d403 | a068 | fd23 | a060 | d223 | a048 | c303 | a048 | bfa0 | 0021 | 1320 | 0000 | 940a | 8009 |
| | 902a | 0009 | 9012 | 000a | d023 | a044 | c103 | a044 | | | | | | | | |
| 1536700 | bda0 | 0020 | 81a0 | 003e | 83a0 | 003f | 81c7 | e008 | 81e8 | 0000 | 0000 | 0000 | 9de3 | bf88 | f027 | a044 |
| | c507 | a044 | c107 | a044 | f227 | a048 | c707 | a048 | | | | | | | | |
| 1536760 | c307 | a048 | 81ad | 0a42 | 0100 | 0000 | 3380 | 0009 | f023 | a044 | c907 | a044 | cb07 | a048 | cd07 | a044 |
| | cf07 | a048 | 91a1 | 0846 | 1080 | 004b | d13f | bff8 | | | | | | | | |
| 1537040 | c103 | a044 | 81a0 | 0120 | f223 | a048 | c303 | a048 | 1100 | 03ca | d51a | 2270 | 81a8 | 0aca | 0100 | 0000 |
| | 3980 | 0019 | f907 | a044 | dd07 | a044 | df07 | a048 | | | | | | | | |
| 1537120 | e907 | a044 | eb07 | a048 | 1100 | 03ca | e51a | 2270 | ada4 | 88d4 | d91a | 2270 | a1a3 | 084e | b1a5 | 89d0 |
| | b1a0 | 0038 | f123 | a060 | d003 | a060 | f323 | a060 | | | | | | | | |
| 1537200 | 4000 | 1862 | d203 | a060 | c13b | a068 | d003 | a068 | 4000 | 016e | d203 | a06c | c327 | a048 | 1080 | 0024 |
| | c127 | a044 | fb07 | a048 | 1500 | 03ca | f51a | a278 | | | | | | | | |
| 1537260 | 81af | 0a5a | 0100 | 0000 | 2380 | 0012 | c907 | a044 | 1100 | 03ca | fd1a | 2270 | fd23 | a060 | d003 | a060 |
| | ff23 | a060 | 1500 | 03ca | c11a | a280 | d203 | a060 | | | | | | | | |
| 1537340 | c123 | a064 | d403 | a064 | c323 | a064 | 4000 | 0912 | d603 | a064 | c327 | a048 | 1080 | 0001 | c127 | a044 |
| | cb07 | a048 | 1700 | 03ca | c51a | e270 | 81a9 | 0a42 | | | | | | | | |
| 1537420 | 0100 | 0000 | 2380 | 000f | d207 | a048 | 1300 | 03ca | cd1b | 2280 | cf27 | a048 | cd27 | a044 | d107 | a044 |
| | d307 | a048 | d507 | a044 | d707 | a048 | 99a2 | 084a | | | | | | | | |
| 1537500 | d93f | bff8 | c11f | bff8 | 81c7 | e008 | 81e8 | 0000 | d007 | a044 | 9610 | 0009 | 9410 | 0008 | 4000 | 18f7 |
| | 9810 | 2001 | 10bf | fff8 | c13f | bff8 | 0000 | 0000 | | | | | | | | |
| 1537560 | 9de3 | bf80 | f023 | a044 | c103 | a044 | 81a0 | 0120 | f223 | a048 | c303 | a049 | c13f | bff8 | f027 | a044 |
| | c507 | a044 | c107 | a044 | f227 | a048 | c707 | a048 | | | | | | | | |
| 1537640 | c307 | a048 | 81a8 | 0a42 | 0100 | 0000 | 3380 | 0009 | d91f | bff8 | c907 | a044 | cb07 | a048 | cd07 | a044 |
| | cf07 | a048 | 91a1 | 0846 | 1080 | 006e | d13f | bff0 | | | | | | | | |
| 1537720 | 1100 | 03ca | d51a | 2348 | 81ab | 0aca | 0100 | 0000 | 2b80 | 002d | d51f | bff8 | e11f | bff8 | 1300 | 03ca |
| | dd1a | 6350 | 81ac | 0ace | 0100 | 0000 | 3980 | 000f | | | | | | | | |
| 1540000 | f507 | a044 | e91f | bff8 | 1100 | 03ca | e51a | 2358 | ada4 | 8854 | ed23 | a060 | d003 | a060 | ef23 | a060 |
| | 4000 | 005b | d203 | a060 | f307 | a048 | f107 | a044 | | | | | | | | |
| 1540060 | 1080 | 0054 | f13f | bff0 | f707 | a048 | f907 | a044 | fb07 | a048 | bda6 | 895c | 1100 | 03ca | c11a | 2360 |
| | 85a0 | 08de | c523 | a060 | d003 | a060 | c723 | a060 | | | | | | | | |
| 1540140 | 4000 | 17ea | d203 | a060 | cb07 | a048 | c907 | a044 | 8da1 | 09c0 | 8da0 | 0026 | cd23 | a064 | d003 | a064 |
| | cf23 | a064 | 4000 | 09f1 | d203 | a064 | 1080 | 003d | | | | | | | | |
| 1540220 | c13f | bff0 | 1500 | 03ca | d11a | a360 | 81aa | 8ac8 | 0100 | 0000 | 3980 | 0020 | d11f | bff8 | dd1f | bff8 |
| | 1700 | 03ca | d91a | e360 | a1a3 | 08ce | e13f | bfe8 | | | | | | | | |
| 1540300 | e91f | bfe8 | e51f | bfe8 | ada4 | 8854 | f51f | bfe8 | f11f | bfe8 | b9a6 | 095a | ed3f | bff8 | fd1f | bff8 |
| | 81a7 | 88dc | c123 | a060 | d003 | a060 | c323 | a060 | | | | | | | | |
| 1540360 | 4000 | 17c6 | d203 | a060 | c707 | a048 | c507 | a044 | 89a0 | 89c0 | 89a0 | 0024 | c923 | a064 | d003 | a064 |
| | cb23 | a064 | 4000 | 09cd | d203 | a064 | 1080 | 0019 | | | | | | | | |
| 1540440 | c13f | bff0 | 1900 | 03ca | cd1b | 2360 | 81aa | 0a46 | 0100 | 0000 | 2380 | 000d | 9210 | 0019 | 1500 | 03ca |
| | d51a | a368 | d523 | a060 | d403 | a060 | d723 | a060 | | | | | | | | |
| 1540520 | d603 | a060 | 9210 | 0019 | 4000 | 0877 | 9010 | 0018 | 1080 | 0008 | c13f | bff0 | 9010 | 0018 | 9410 | 0008 |
| | 9610 | 0009 | 4000 | 1871 | 9810 | 2002 | c13f | bff0 | | | | | | | | |
| 1540600 | c11f | bff0 | 81c7 | e008 | 81c8 | 0000 | 81c3 | e008 | 9000 | 2001 | 0000 | 0000 | 9de3 | bf68 | 151f | fc00 |
| | 960e | 000a | 80a2 | c00a | f227 | a048 | f027 | a044 | | | | | | | | |
| 1540660 | 1280 | 0006 | 153f | fc00 | b02e | 000a | 8096 | 0019 | 1280 | 0003 | 9010 | 2001 | 9010 | 2000 | 8090 | 0008 |
| | 2280 | 0009 | d107 | a044 | c107 | a044 | c307 | a048 | | | | | | | | |
| 1540740 | c507 | a044 | c707 | a048 | 89a0 | 0842 | 1080 | 0073 | c93f | bff8 | d307 | a048 | 1100 | 03cc | cd1a | 2058 |
| | 81aa | 0ac6 | 0100 | 0000 | 3980 | 0006 | dd07 | a044 | | | | | | | | |
| 1541020 | d507 | a044 | 95a0 | 00aa | d527 | a044 | d107 | a044 | df07 | a048 | 1300 | 03cc | d91a | 6060 | 81ab | 8acc |
| | 0100 | 0000 | 3d80 | 0036 | dd07 | a044 | d007 | a044 | | | | | | | | |
| 1541100 | 131f | fc00 | 900a | 0009 | 80a2 | 0009 | 1280 | 0003 | 9010 | 2001 | 9010 | 2000 | 8090 | 0008 | 3280 | 0005 |
| | d207 | a048 | 1500 | 03cc | 1080 | 0053 | e11a | a058 | | | | | | | | |
| 1541160 | 4000 | 0100 | d007 | a044 | e707 | a048 | e507 | a044 | 1700 | 03cb | e91a | e040 | ada4 | 88d4 | ed3f | bff0 |
| | d007 | bff0 | 4000 | 0e91 | d207 | bff4 | 1900 | 03d2 | | | | | | | | |
| 1541240 | f11b | 2380 | b5a6 | 0940 | f53b | a060 | d007 | bff0 | 4000 | 0e8c | d207 | bff4 | 1b00 | 03d2 | f91b | 6378 |
| | bda7 | 0940 | 1100 | 03cb | c11b | a060 | 85a7 | 88c0 | | | | | | | | |
| 1541320 | c53b | a068 | cf07 | a048 | cd07 | a044 | c91a | 2038 | 91a1 | 09c6 | 91a0 | 0028 | d123 | a070 | d003 | a070 |
| | d323 | a070 | 4000 | 1745 | d203 | a070 | d51b | a068 | | | | | | | | |
| 1541400 | 99a0 | 094a | 1080 | 002d | d93f | bff8 | df07 | a048 | e107 | a044 | e307 | a048 | a5a3 | 8950 | 1100 | 03cc |
| | 2300 | 03cb | a214 | 6090 | ba10 | 2040 | 2500 | 03cb | | | | | | | | |
| 1541460 | b610 | 2008 | 8090 | 001b | a414 | a048 | b807 | 4011 | ba07 | 4012 | e53f | bfe8 | e91a | 2058 | e93f | bff0 |
| | ed1a | 2058 | 0680 | 0014 | ed3f | bfe0 | f11f | bff0 | | | | | | | | |
| 1541540 | f51f | bfe8 | b9a6 | 095a | fd07 | 4000 | ff07 | 6004 | c51f | bfe0 | c91f | bfe8 | 81a7 | 085e | 8da0 | 8944 |
| | b6a6 | e001 | ba27 | 6008 | c13f | bff0 | d307 | 2004 | | | | | | | | |
| 1541620 | d107 | 0000 | b827 | 2008 | 95a1 | 8848 | 1cbf | fff0 | d53f | bfe0 | d91f | bff0 | dd1f | bfe0 | a1a3 | 09ce |
| | a1a0 | 0030 | e13f | bff8 | c11f | bff8 | 81c7 | e008 | | | | | | | | |
| 1541700 | 81e8 | 0000 | 9de3 | bf68 | 151f | fc00 | 960e | 000a | 80a2 | c00a | f227 | a048 | f027 | a044 | 1280 | 0006 |
| | 153f | fc00 | b02e | 000a | 8096 | 0019 | 1280 | 0003 | | | | | | | | |
| 1541760 | 9010 | 2001 | 9010 | 2000 | 8090 | 0008 | 2280 | 0009 | d107 | a044 | c107 | a044 | c307 | a048 | c507 | a044 |
| | c707 | a048 | 89a0 | 0842 | 1080 | 0093 | c93f | bff8 | | | | | | | | |
| 1542040 | d307 | a048 | 1100 | 03cc | cd1a | 2068 | 81aa | 0ac6 | 0100 | 0000 | 2b80 | 0018 | e107 | a044 | d907 | a044 |
| | db07 | a048 | 1300 | 03cc | d51a | 6068 | 81ab | 0a4a | | | | | | | | |

| | | | | | | | | | | | | | | | | | | | | | | | | |
|---|---|---|---|---|---|---|---|---|---|---|---|---|---|---|---|---|---|---|---|---|---|---|---|---|
| 1542120 | 0100 | 0000 | 0380 | 0009 | d207 | a048 | d007 | a044 | 9610 | 0009 | 9410 | 0008 | 4000 | 17b4 | 9810 | 2008 | 1080 | 007d | c13f | bff8 | d007 | a044 | 9610 | 0009 |
| 1542200 | 9410 | 0008 | 4000 | 17ad | 9810 | 2009 | 1080 | 0076 | c13f | bff8 | e307 | a048 | 1500 | 03cc | dd1a | a070 | 81ac | 0ace | 0100 | 0000 | 3d80 | 0037 | e507 | a044 |
| 1542260 | d007 | a044 | 131f | fc00 | 900a | 0009 | 80a2 | 0009 | 1280 | 0003 | 9010 | 2001 | 9010 | 2000 | 8090 | 0008 | 3280 | 0006 | d207 | a048 | 1700 | 03cc | e51a | e068 |
| 1542340 | 1080 | 0061 | e53f | bff8 | 4000 | 0062 | d007 | a044 | eb07 | a048 | e907 | a044 | 1900 | 03cb | ed1b | 2040 | b1a5 | 08d6 | f13f | bff0 | d007 | bff0 | 4000 | 0df5 |
| 1542420 | d207 | bff4 | 1b00 | 03d2 | f51b | 6380 | b9a6 | 8940 | f93b | a060 | d007 | bff0 | 4000 | 0dec | d207 | bff4 | c91b | a060 | 1f00 | 03d2 | fd1b | e378 | 85a7 | 8940 |
| 1542500 | 1100 | 03cb | 8da0 | 8944 | cd3b | a068 | d707 | a048 | d507 | a044 | d11a | 2038 | 99a2 | 09ca | 99a0 | 002c | d923 | a070 | d003 | a070 | db23 | a070 | 4000 | 16a7 |
| 1542560 | d203 | a070 | dd1b | a068 | a1a0 | 094e | 1080 | 003a | e13f | bff8 | e707 | a048 | e907 | a044 | eb07 | a048 | ada4 | 8954 | 1100 | 03cc | 2500 | 03cb | a414 | a200 |
| 1542640 | ba10 | 2040 | 2700 | 03cb | b610 | 2008 | 8090 | 001b | a614 | e1b8 | b807 | 4012 | ba07 | 4013 | ed3f | bfe8 | f11a | 2068 | f13f | bff0 | f51a | 2068 | 0680 | 0014 |
| 1542720 | f53f | bfe0 | f91f | bff0 | fd1f | bfe8 | 81a7 | 095e | c507 | 4000 | c707 | 6004 | cd1f | bfe0 | d11f | bfe8 | 89a0 | 0842 | 95a1 | 8948 | b6a6 | e001 | ba27 | 6008 |
| 1543000 | c93f | bff0 | db07 | 2004 | d907 | 0000 | b827 | 2008 | 9da2 | 884c | 1cbf | fff0 | dd3f | bfe0 | d207 | a048 | 4000 | 0976 | d007 | a044 | c13b | a060 | d007 | a044 |
| 1543060 | 7fff | feda | d207 | a048 | f51f | bfe0 | f11f | bff0 | b9a6 | 09da | b9a0 | 003c | 2d00 | 03cb | e11d | a038 | a5a4 | 0940 | e91b | a060 | ada4 | 8954 | bda7 | 0856 |
| 1543140 | fd3f | bff8 | c11f | bff8 | 81c7 | e008 | 81e8 | 0000 | 9de3 | bfa0 | f027 | a044 | f107 | a044 | f227 | a048 | f307 | a048 | 81a6 | 0958 | 1100 | 03cc | c51a | 2078 |
| 1543220 | 1100 | 03cc | d11a | 2080 | cd1a | 2080 | bba0 | 0029 | 89a0 | 89c0 | 89a0 | 0024 | b9a0 | 0028 | bfa0 | 0027 | bda0 | 0026 | 1700 | 03cb | 9612 | e110 | b810 | 2006 |
| 1543300 | b7a0 | 0025 | b5a0 | 0024 | 1900 | 03cb | ba10 | 2030 | b607 | 400b | 9813 | 20d8 | 8090 | 001c | 0680 | 0012 | ba07 | 400c | 95a7 | 895a | d907 | 4000 | db07 | 6004 |
| 1543360 | e506 | c000 | e706 | e004 | 9da2 | 884c | a1a7 | 095a | b8a7 | 2001 | ba27 | 6008 | b626 | e008 | a9a4 | 0852 | bfa0 | 002f | bda0 | 002e | bba0 | 0035 | 1cbf | fff2 |
| 1543440 | b9a0 | 0034 | ada7 | 89dc | ada0 | 0036 | 2100 | 03d2 | 1100 | 03cc | 2700 | 03cb | a614 | e180 | b810 | 2030 | 2900 | 03cb | b610 | 2006 | 8090 | 001b | a815 | 2148 |
| 1543520 | ba07 | 0013 | b807 | 0014 | ed3c | 2378 | c51a | 2080 | c11a | 2080 | bba0 | 0023 | b9a0 | 0022 | bfa0 | 0021 | 0680 | 0012 | bda0 | 0020 | 89a7 | 895a | cd07 | 0000 |
| 1543600 | cf07 | 2004 | d907 | 4000 | db07 | 6004 | 91a1 | 0846 | 95a7 | 095a | b6a6 | e001 | b827 | 2008 | ba27 | 6008 | 9da2 | 884c | bfa0 | 0029 | bda0 | 0028 | bba0 | 002f |
| 1543660 | 1cbf | fff2 | b9a0 | 002e | a9a7 | 89dc | a9a0 | 0034 | 2f00 | 03cc | 3100 | 03d2 | e11d | e088 | a5a4 | 09d8 | a5a0 | 0032 | ada4 | 8954 | ed3e | 2380 | 81c7 | e008 |
| 1543740 | 91e8 | 2000 | 9de3 | bf58 | f027 | a044 | f227 | a048 | fd23 | a060 | ff23 | a064 | 151f | fc00 | 960e | 000a | 80a2 | c00a | 1280 | 0006 | 153f | fc00 | b02e | 000a |
| 1544020 | 8096 | 0019 | 1280 | 0003 | 9010 | 2001 | 9010 | 2000 | fd03 | a060 | ff03 | a064 | 8090 | 0008 | 2280 | 000a | cd07 | a044 | c107 | a044 | c307 | a048 | c507 | a044 |
| 1544100 | c707 | a048 | 89a0 | 0842 | bfa0 | 0025 | 1080 | 009a | bda0 | 0024 | cf07 | a048 | cd3f | bff8 | d507 | a044 | d707 | a048 | 1100 | 03cc | d11a | 2090 | 81aa | 8ac8 |
| 1544160 | 0100 | 0000 | 3980 | 0007 | e11f | bff8 | d907 | a044 | db07 | a048 | 99a0 | 00ac | d93f | bff8 | e11f | bff8 | 1300 | 03cc | dd1a | 6098 | 81ac | 0ace | 0100 | 0000 |
| 1544240 | 3d80 | 0058 | c51f | bff8 | d007 | a044 | fd23 | a060 | ff23 | a064 | 131f | fc00 | 900a | 0009 | 80a2 | 0009 | 1280 | 0003 | 9010 | 2001 | 9010 | 2000 | 8090 | 0008 |
| 1544320 | 3280 | 000b | d207 | bffc | e907 | a044 | eb07 | a048 | 1500 | 03cc | e51a | a0a0 | ada4 | 89d4 | ada0 | 0036 | bfa0 | 0037 | 1080 | 0070 | bda0 | 0036 | 4000 | 012a |
| 1544400 | d007 | bff8 | c11f | bff8 | 1700 | 03cc | f11a | e0a8 | 1900 | 03cb | f51b | 2040 | b9a6 | 095a | 2100 | 03cc | 85a0 | 08dc | bfa0 | 0023 | bda0 | 0022 | fd3b | a068 |
| 1544460 | d003 | a068 | d203 | a06c | fd23 | a060 | ff23 | a064 | 4000 | 0ce6 | 0100 | 0000 | ff03 | a064 | fd03 | a060 | 1b00 | 03d2 | c91b | 6380 | 8da1 | 0940 | cd3b | a070 |
| 1544540 | fd3b | a078 | d003 | a078 | d203 | a07c | fd23 | a060 | 4000 | 0cdc | 0100 | 0000 | d91b | a070 | 1f00 | 03d2 | d11b | e378 | 95a2 | 0940 | 1100 | 03cb | 9da2 | 88cc |
| 1544620 | dd3b | a080 | e51f | bff8 | e11a | 2038 | a9a4 | 09d2 | a9a0 | 0034 | e923 | a088 | d003 | a088 | eb23 | a088 | 4000 | 1596 | d203 | a088 | ed1b | a080 | b1a0 | 0956 |
| 1544700 | fb07 | a048 | f907 | a044 | f51c | 2090 | 81af | 0ada | bfa0 | 0039 | 0100 | 0000 | 1980 | 0007 | bda0 | 0038 | 81a0 | 003e | 83a0 | 003f | 81a0 | 00a0 | bfa0 | 0021 |
| 1544760 | bda0 | 0020 | bda0 | 003e | 1080 | 002f | bfa0 | 003f | c91f | bff8 | 8da0 | 8944 | 1100 | 03cc | 2700 | 03cb | a614 | e290 | ba10 | 2040 | 2900 | 03cb | b610 | 2008 |
| 1545040 | 8090 | 001b | a815 | 2248 | b807 | 4013 | ba07 | 4014 | cd3f | bff0 | d11a | 2090 | d51a | 2090 | bfa0 | 0029 | bda0 | 0028 | 0680 | 0014 | d53f | bfe8 | e107 | 4000 |
| 1545120 | e307 | 6004 | d91f | bff0 | 9da7 | 894c | e91f | bfe8 | ed1f | bff0 | f507 | 0000 | f707 | 2004 | a5a3 | 8850 | b1a5 | 0956 | b6a6 | e001 | ba27 | 6008 | b827 | 2008 |
| 1545200 | b9a6 | 085a | bfa0 | 0033 | bda0 | 0032 | 1cbf | fff0 | f93f | bfe8 | c107 | a044 | c307 | a048 | 85a0 | 095e | c91f | bfe8 | 8da0 | 89c4 | 8da0 | 0026 | bfa0 | 0027 |
| 1545260 | bda0 | 0026 | 81a0 | 003e | 83a0 | 003f | 81c7 | e008 | 81e8 | 0000 | 9de3 | bf68 | 151f | fc00 | 960e | 000a | 80a2 | c00a | f227 | a048 | f027 | a044 | 1280 | 0006 |
| 1545340 | 153f | fc00 | b02e | 000a | 8096 | 0019 | 1280 | 0003 | 9010 | 2001 | 9010 | 2000 | 8090 | 0008 | 2280 | 0009 | d107 | a044 | c107 | a044 | c307 | a048 | c507 | a044 |
| 1545420 | c707 | a048 | 89a0 | 0842 | 1080 | 00a0 | c93f | bff8 | d307 | a048 | 1100 | 03cc | cd1a | 20b0 | 81aa | 0ac6 | 0100 | 0000 | 2b80 | 0018 | e107 | a044 | d907 | a044 |
| 1545500 | db07 | a048 | 1300 | 03cc | d51a | 60b0 | 81ab | 0a4a | 0100 | 0000 | 0380 | 0009 | d207 | a048 | d007 | a044 | 9610 | 0009 | 9410 | 0008 | 4000 | 15f4 | 9810 | 200a |
| 1545560 | 1080 | 008a | c13f | bff8 | d007 | a044 | 9610 | 0009 | 9410 | 0008 | 4000 | 15ed | 9810 | 200b | 1080 | 0083 | c13f | bff8 | e307 | a048 | 1500 | 03cc | dd1a | a0b8 |
| 1545640 | 81ac | 0ace | 0100 | 0000 | 3d80 | 003a | e007 | a044 | d007 | a044 | 131f | fc00 | 900a | 0009 | 80a2 | 0009 | 1280 | 0003 | 9010 | 2001 | 9010 | 2000 | 8090 | 0008 |
| 1545720 | 3280 | 0006 | d207 | a048 | 1700 | 03cc | e51a | e0b0 | 1080 | 006e | e53f | bff8 | 4000 | 006f | d007 | a044 | f707 | a048 | f507 | a044 | 1900 | 03cc | e91b | 20c0 |
| 1546000 | 1b00 | 03cb | ed1b | 6040 | b1a5 | 0956 | 2100 | 03d2 | b9a6 | 88d8 | f93f | bff0 | d007 | bff0 | 4000 | 0c31 | d207 | bff4 | 1f00 | 03d2 | fd1b | e380 | 85a7 | 8940 |
| 1546060 | c53b | a060 | d007 | bff0 | 4000 | 0c28 | d207 | bff4 | c91c | 2378 | 8da1 | 0940 | d11b | a060 | 1100 | 03cb | 95a1 | 8848 | d53b | a068 | df07 | a048 | dd07 | a044 |
| 1546140 | d91a | 2038 | a1a3 | 09ce | a1a0 | 0030 | e123 | a070 | d003 | a070 | e323 | a070 | 4000 | 14e4 | d203 | a070 | e51b | a068 | a9a0 | 0952 | 1080 | 0044 | e93f | bff8 |
| 1546220 | ef07 | a048 | f107 | a044 | f307 | a049 | b5a5 | 8958 | 1100 | 03cc | 2700 | 03cc | a614 | e008 | ba10 | 2048 | 2900 | 03cb | b610 | 2009 | 8090 | 001b | a815 | 23b8 |
| 1546300 | b807 | 4013 | ba07 | 4014 | f53f | bfe8 | f91a | 20b0 | f93f | bff0 | fd1a | 20b0 | 0680 | 0014 | fd3f | bfe0 | c11f | bff0 | c51f | bfe8 | 89a0 | 0942 | cd07 | 4000 |
| 1546360 | cf07 | 6004 | d51f | bfe0 | d91f | bfe8 | 91a1 | 0846 | 9da2 | 894c | b6a6 | e001 | ba27 | 6008 | d13f | bff0 | e307 | 2004 | e107 | 0000 | b827 | 2008 | a5a3 | 8850 |
| 1546440 | 1cbf | fff0 | e53f | bfe0 | d207 | a048 | 4000 | 07b3 | d007 | a044 | c13b | a060 | d007 | a044 | 7fff | feaa | d207 | a048 | e91b | a060 | ada0 | 0954 | f707 | a048 |
| 1546520 | f507 | a044 | cd1f | bff0 | cb07 | a048 | c907 | a044 | 91a1 | 0946 | d51f | bfe0 | 2f00 | 03cc | f11d | e0c8 | b9a6 | 09da | b9a0 | 003c | 3100 | 03cb | c11e | 2038 |
| 1546600 | 99a2 | 09ca | 99a0 | 002c | bda5 | 88dc | 85a0 | 095e | 9da3 | 0842 | dd3f | bff8 | c11f | bff8 | 81c7 | e008 | 81e8 | 0000 | 9de3 | bfa0 | f027 | a044 | f107 | a044 |
| 1546660 | f227 | a048 | f307 | a048 | 81a6 | 0958 | 1100 | 03cc | c51a | 20d0 | 1100 | 03cc | d11a | 20d8 | cd1a | 20d8 | bba0 | 0029 | 89a0 | 89c0 | 89a0 | 0024 | b9a0 | 0028 |
| 1546740 | bfa0 | 0027 | bda0 | 0026 | 1700 | 03cb | 9612 | e310 | b810 | 2006 | b7a0 | 0025 | b5a0 | 0024 | 1900 | 03cb | ba10 | 2030 | b607 | 400b | 9813 | 22d8 | 8090 | 001c |
| 1547020 | 0680 | 0012 | ba07 | 400c | 95a7 | 895a | d907 | 4000 | db07 | 6004 | e506 | c000 | e706 | e004 | 9da2 | 884c | a1a7 | 095a | b8a7 | 2001 | ba27 | 6008 | b626 | e008 |
| 1547100 | a9a4 | 0852 | bfa0 | 002f | bda0 | 002e | bba0 | 0035 | 1cbf | fff2 | b9a0 | 0034 | ada7 | 89dc | ada0 | 0036 | 2100 | 03d2 | 1100 | 03cc | 2700 | 03cb | a614 | e380 |
| 1547160 | b810 | 2030 | 2900 | 03cb | b610 | 2006 | 8090 | 001b | a815 | 2348 | ba07 | 0013 | b807 | 0014 | ed3c | 2378 | c51a | 20d8 | c11a | 20d8 | bba0 | 0023 | b9a0 | 0022 |

| | | | | | | | | | | | | | | | | | | | | | | | | |
|---|---|---|---|---|---|---|---|---|---|---|---|---|---|---|---|---|---|---|---|---|---|---|---|---|
| 1547240 | bfa0 | 0021 | 0680 | 0012 | bda0 | 0020 | 89a7 | 895a | cd07 | 0000 | cf07 | 2004 | d907 | 4000 | db07 | 6004 | 91a1 | 0846 | 95a7 | 095a | b6a6 | e001 | b827 | 2308 |
| 1547320 | ba27 | 6008 | 9da2 | 884c | bfa0 | 0029 | bda0 | 0028 | bba0 | 002f | 1cbf | fff2 | b9a0 | 002e | a9a7 | 89dc | a9a0 | 0034 | 2f00 | 03cc | 3100 | 03d2 | e11d | e0e0 |
| 1547400 | a5a4 | 09d8 | a5a0 | 0032 | ada4 | 8954 | ed3e | 2380 | 81c7 | e008 | 91e8 | 2000 | 9de3 | bf78 | 8090 | 0018 | f427 | a04c | 1680 | 0006 | f227 | a048 | c11f | a048 |
| 1547460 | 81a0 | 00a0 | c13f | a048 | b020 | 0018 | 8090 | 0018 | 3280 | 000f | 80a6 | 2001 | d207 | a04c | d007 | a048 | f523 | a060 | f723 | a064 | f923 | a068 | fb23 | a06c |
| 1547540 | fd23 | a070 | ff23 | a074 | 7fff | fc8c | 0100 | 0000 | bfa0 | 0021 | 1080 | 00ba | bda0 | 0020 | 3280 | 000f | c51f | a048 | d207 | a04c | d007 | a048 | f523 | a060 |
| 1547620 | f723 | a064 | f923 | a068 | fb23 | a06c | fd23 | a070 | ff23 | a074 | 7fff | fe10 | 0100 | 0000 | bfa0 | 0021 | 1080 | 00ab | bda0 | 0020 | c91f | a048 | 81a8 | 8a44 |
| 1547700 | 0100 | 0000 | 3380 | 0008 | d11f | a048 | cd1f | a046 | d11f | a048 | 95a1 | 8848 | bfa0 | 002b | 1080 | 00a0 | bda0 | 002a | 1300 | 03cc | d91a | 60e8 | 81ab | 8a4c |
| 1547760 | 0100 | 0000 | 3380 | 0027 | 1500 | 03cc | d007 | a048 | f523 | a060 | f723 | a064 | f923 | a068 | fb23 | a06c | fd23 | a070 | ff23 | a074 | 131f | fc00 | 900a | 0009 |
| 1550040 | 90a2 | c009 | 1280 | 0003 | 9010 | 2001 | 9010 | 2000 | 8090 | 0008 | 2280 | 0017 | 1500 | 03cc | f023 | a078 | e303 | a078 | a5a0 | 1911 | e91f | a048 | b7a0 | 0033 |
| 1550120 | b5a0 | 0032 | 81ae | 8ad4 | 0100 | 0000 | 3480 | 0011 | d207 | a04c | d91f | a048 | dd1f | a048 | a1a3 | 094e | 1900 | 03cc | e51b | 20e8 | bfa0 | 0033 | bda0 | 0032 |
| 1550200 | ba06 | 2010 | bba0 | 0031 | 1080 | 003c | b9a0 | 0030 | e11a | a0e8 | bfa0 | 0031 | 1080 | 0071 | bda0 | 0030 | d007 | a048 | f523 | a060 | f723 | a064 | 7fff | fc3b |
| 1550260 | ba10 | 2001 | b5a0 | 0020 | b7a0 | 0021 | d007 | a048 | d207 | a04c | f523 | a060 | f723 | a064 | 7fff | fdc6 | 0100 | 0000 | bfa0 | 0021 | bda0 | 0020 | f703 | a064 |
| 1550340 | f503 | a060 | 80a7 | 4018 | 3680 | 0017 | bda0 | 003e | b9a0 | 003e | bba0 | 003f | 1700 | 03cc | ed1a | e0f0 | fa23 | a078 | f103 | a078 | 81a0 | 1918 | c91f | a048 |
| 1550420 | ba07 | 6001 | 80a7 | 4018 | 85a5 | 8940 | 8da0 | 89c4 | 8da0 | 0026 | 91a1 | 895e | 95a2 | 08da | b7a0 | 003d | b5a0 | 003c | bfa0 | 002b | 06bf | ffee | bda0 | 002a |
| 1550500 | bda0 | 003e | 1080 | 0146 | bfa0 | 003f | e91b | e0f0 | fa23 | a078 | ed03 | a078 | b1a0 | 1916 | ba27 | 6001 | 81a5 | 0958 | 85a0 | 08de | 89a7 | 09c2 | 89a0 | 0024 |
| 1550560 | bfa0 | 0025 | bda0 | 0024 | 80a7 | 4018 | 34bf | fff4 | 1f00 | 03cc | d91f | a048 | 2100 | 03cc | cd1c | 20f0 | 91a1 | 895a | 2300 | 03cc | ba26 | 2001 | 8090 | 001d |
| 1550640 | 95a2 | 08de | 9da3 | 09ca | 9da0 | 002e | dd3f | bff8 | e11c | 60f8 | f51f | bff8 | bfa0 | 0031 | 0480 | 0016 | bda0 | 0030 | b9a0 | 003e | bba0 | 003f | 2700 | 03cc |
| 1550720 | e51c | e0f0 | fa23 | a078 | e903 | a078 | ada0 | 1914 | c11f | a048 | ba27 | 6001 | 8090 | 0014 | b1a4 | 8956 | 85a6 | 09c0 | 85a0 | 0022 | 89a0 | 895e | 8da1 | 08da |
| 1551000 | b7a0 | 003d | b5a0 | 003c | bfa0 | 0027 | 14bf | ffee | bda0 | 0026 | d207 | a04c | d007 | a048 | f523 | a060 | f723 | a064 | f923 | a068 | fb23 | a06c | fd23 | a070 |
| 1551060 | ff23 | a074 | 7fff | fbd9 | 0100 | 0000 | d11f | bff8 | 95a2 | 0940 | ff03 | a074 | fd03 | a070 | 99a2 | 89de | 99a0 | 002c | bfa0 | 002d | bda0 | 002c | 81a0 | 003e |
| 1551140 | 83a0 | 003f | 81c7 | e008 | 81e8 | 0000 | 9de3 | bf78 | f227 | a048 | f427 | a04c | c51f | a048 | c11f | a048 | 81a8 | 0a42 | 0100 | 0000 | 3380 | 0008 | d91f | a048 |
| 1551220 | c91f | a048 | cd1f | a048 | 91a1 | 0846 | bfa0 | 0029 | 1080 | 0090 | bda0 | 0028 | 1100 | 03cc | d51a | 2100 | 81ab | 0aca | 0100 | 0000 | 2b80 | 0029 | 8090 | 0018 |
| 1551300 | e11f | a048 | 1300 | 03cc | dd1a | 6100 | 81ac | 0a4e | 0100 | 0000 | 0380 | 0012 | f023 | a068 | e303 | a068 | a5a0 | 1911 | 9810 | 200c | 9610 | 001a | 9410 | 0019 |
| 1551360 | e523 | a06c | d003 | a06c | e723 | a06c | d203 | a06c | fd23 | a060 | ff23 | a064 | 4000 | 140c | 0100 | 0000 | bfa0 | 0021 | 1080 | 0073 | bda0 | 0020 | e703 | a068 |
| 1551440 | a9a0 | 1913 | 9810 | 200d | 9610 | 001a | 9410 | 0019 | e923 | a06c | d003 | a06c | eb23 | a06c | d203 | a06c | fd23 | a060 | ff23 | a064 | 4000 | 13fc | 0100 | 0000 |
| 1551520 | bfa0 | 0021 | 1080 | 0063 | bda0 | 0020 | 1680 | 0010 | b810 | 2001 | b020 | 0018 | 9610 | 0018 | 8090 | 000b | 1680 | 0006 | 9810 | 2001 | 9620 | 000b | 960b | 000b |
| 1551600 | 1080 | 0003 | 9620 | 000b | 960a | c00c | 8032 | e001 | 3280 | 0004 | 8090 | 0018 | b810 | 3fff | 8090 | 0018 | 3280 | 000b | 80a6 | 2001 | d207 | a04c | d007 | a048 |
| 1551660 | fd23 | a060 | ff23 | a064 | 7fff | fc03 | 0100 | 0000 | bfa0 | 0021 | 1080 | 0047 | bda0 | 0020 | 3280 | 000f | d007 | a048 | d207 | a04c | d007 | a048 | fd23 | a060 |
| 1551740 | ff23 | a064 | 7fff | f1b8 | 0100 | 0000 | f823 | a068 | eb03 | a068 | ada0 | 1915 | b1a5 | 8940 | bfa0 | 0039 | 1080 | 0038 | bda0 | 0038 | fd23 | a060 | ff23 | a064 |
| 1552020 | 131f | fc00 | 900a | 0009 | 80a2 | 0009 | 1280 | 0003 | 9010 | 2001 | 9010 | 2000 | 8090 | 0008 | 3280 | 0007 | d207 | a04c | 1b00 | 03cc | f51b | 6100 | bfa0 | 003b |
| 1552100 | 1080 | 0028 | bda0 | 003a | 7fff | fbdf | d007 | a048 | c13f | bff8 | d007 | a048 | 7fff | fd9b | d207 | a04c | bfa0 | 0021 | bda0 | 0020 | ba10 | 2001 | 80a7 | 4018 |
| 1552160 | 3680 | 0017 | f823 | a068 | fd3f | bff0 | 1f00 | 03cc | f91b | e108 | fa23 | a068 | c103 | a068 | 85a0 | 1900 | cd1f | a048 | d91f | bff8 | 89a7 | 0942 | e11f | bff0 |
| 1552240 | e13f | bff8 | ba07 | 6001 | 80a7 | 4018 | 91a1 | 09c6 | 91a0 | 0028 | 95a2 | 095e | 9da2 | 88cc | bfa0 | 002f | 06bf | ffee | bda0 | 002e | f823 | a068 | e303 | a068 |
| 1552320 | a5a0 | 1911 | a9a4 | 895e | bfa0 | 0035 | bda0 | 0034 | 81a0 | 003e | 83a0 | 003f | 81c7 | e008 | 81e8 | 0000 | 9de3 | bf90 | f027 | a044 | 131f | fc00 | b00e | 0009 |
| 1552400 | 80a6 | 0009 | 9010 | 2001 | 1280 | 0003 | f227 | a048 | 9010 | 200c | 8090 | 0008 | 3280 | 0009 | 1300 | 03cc | c107 | a044 | c307 | a048 | c507 | a044 | c707 | a048 |
| 1552460 | 89a0 | 0942 | 1080 | 0023 | c93f | bff8 | 9010 | 2001 | d022 | 61d0 | d307 | a048 | d107 | a044 | 1500 | 03cc | cd1a | a298 | 81aa | 0ac6 | 0100 | 0000 | 2b80 | 0007 |
| 1552540 | d907 | a044 | d207 | a048 | 4000 | 008c | d007 | a044 | 1080 | 0014 | c13f | bff8 | db07 | a048 | 1700 | 03cc | d51a | e2a0 | 81ab | 0aca | 0100 | 0000 | 1d80 | 0006 |
| 1552620 | d207 | a048 | 4000 | 000e | d007 | a044 | 1080 | 0009 | c13f | bff8 | 4000 | 00d9 | d007 | a044 | c13b | a060 | d003 | a060 | 4000 | 0591 | d203 | a064 | c13f | bff8 |
| 1552700 | c11f | bff8 | 81c7 | e008 | 81e8 | 0000 | 9de3 | bf88 | f027 | a044 | f227 | a048 | fd23 | a060 | ff23 | a064 | 131f | fc00 | b00e | 0009 | 80a6 | 0009 | 1280 | 0003 |
| 1552760 | 9010 | 2001 | 9010 | 2000 | 8090 | 0008 | 3280 | 0005 | c507 | a044 | fd07 | a044 | 1080 | 0060 | ff07 | a048 | c707 | a048 | 1100 | 03cc | c11a | 22a8 | 81a8 | 8ac0 |
| 1553040 | 0100 | 0000 | 3d80 | 0005 | c907 | a044 | fd07 | a044 | 1080 | 002c | ff07 | a048 | cb07 | a048 | cd07 | a044 | cf07 | a048 | 91a1 | 0946 | 1300 | 03cc | d51a | 62b0 |
| 1553120 | 1500 | 03cc | 1700 | 03cc | b810 | 2005 | 8090 | 001c | 9612 | e1e8 | ba10 | 2028 | ba07 | 400b | 99a2 | 89c8 | 99a0 | 002c | d93f | bff8 | dd1a | a2b8 | bfa0 | 002f |
| 1553200 | 0680 | 000c | bda0 | 002e | e11f | bff8 | a5a7 | 8950 | e907 | 4000 | eb07 | 6004 | b8a7 | 2001 | ba27 | 6008 | ada4 | 8854 | bfa0 | 0037 | 1cbf | fff8 | bda0 | 0036 |
| 1553260 | f107 | a044 | f307 | a048 | b5a7 | 89d8 | b5a0 | 003a | c507 | a044 | 1b00 | 03cc | f91b | 61d8 | c707 | a048 | 81a6 | 885c | 89a0 | 88c0 | bfa0 | 0025 | bda0 | 0024 |
| 1553340 | d207 | a048 | d007 | a044 | fd23 | a060 | ff23 | a064 | 4000 | 0542 | 0100 | 0000 | d307 | a048 | d107 | a044 | ff03 | a064 | fd03 | a060 | 1f00 | 03cc | cd1b | e2c0 |
| 1553420 | 95a2 | 08c6 | 131f | fc00 | 99a2 | 8940 | 9da3 | 08de | bfa0 | 002f | bda0 | 002e | fd3b | a068 | d003 | a068 | fd23 | a060 | ff23 | a064 | 900a | 0009 | 80a2 | 0009 |
| 1553500 | 1280 | 0003 | 9010 | 2001 | 9010 | 2000 | fd03 | a060 | ff03 | a064 | 8090 | 0008 | 3280 | 000b | bda0 | 003e | d207 | a048 | d007 | a044 | 9610 | 0009 | 9410 | 0008 |
| 1553560 | 4000 | 12f2 | 9810 | 200e | bfa0 | 0021 | bda0 | 0020 | bda0 | 003e | bfa0 | 003f | 81a0 | 003e | 83a0 | 003f | 81c7 | e008 | 81e8 | 0000 | 9de3 | bf78 | f027 | a044 |
| 1553640 | f227 | a048 | 9010 | 0018 | 4000 | 17c6 | 9210 | 0019 | c13f | bff8 | c51f | bff8 | c307 | a048 | c107 | a044 | 81a8 | 0a42 | 0100 | 0000 | 2380 | 000a | c907 | a044 |
| 1553720 | d207 | a048 | d007 | a044 | 9610 | 0009 | 9410 | 0008 | 4000 | 12d6 | 9810 | 200f | 1080 | 0045 | c13f | bff0 | 89a0 | 00a4 | c927 | a044 | d11f | bff8 | 1100 | 03cc |
| 1554000 | cd1a | 22c8 | 95a2 | 0946 | d523 | a060 | d003 | a060 | d723 | a060 | 4000 | 1762 | d203 | a060 | e11f | bff8 | 1300 | 03cc | d91a | 62d0 | 9da3 | 0940 | 1900 | 03cc |
| 1554060 | a5a4 | 09ce | a7a0 | 1152 | e723 | a064 | ed1f | bff8 | eb07 | a048 | e907 | a044 | b1a5 | 08d6 | fa03 | a064 | 9427 | 6001 | ba02 | 801d | f13f | bff8 | f91f | bff8 |
| 1554140 | f51b | 22d8 | 81af | 0ada | 0100 | 0000 | 3980 | 0007 | 1f00 | 03cc | fd1f | bff8 | bda0 | 00be | fd3f | bff8 | ba20 | 001d | 1f00 | 03cc | fa23 | e1d0 | c51f | bff8 |
| 1554220 | 2100 | 03cc | c11c | 21e0 | 89a0 | 0942 | c923 | a060 | d003 | a060 | cb23 | a060 | 4000 | 090c | d203 | a060 | c13b | a068 | d007 | a044 | 4000 | 0014 | d207 | a048 |
| 1554300 | cf07 | a048 | cd07 | a044 | 91a1 | 8940 | d51b | a068 | dd1c | 21e0 | 99a2 | 094a | a1a3 | 09ce | a1a0 | 0030 | e123 | a070 | d003 | a070 | e323 | a070 | 4000 | 04c3 |

```
1554360 d203 a070 81a0 00a0 c13f bff0 c11f bff0 81c7 e008 81e8 0000 9de3 bf80 f027 a044 fd07 a044 f227 a048 ff07 a048 1100 03cc
1554440 c11a 22e0 81af 8ac0 0100 0000 3980 0018 1500 03cc 1300 03cc c51a 62e8 89a7 8842 c923 a078 d003 a078 cb23 a078 d203 a078
1554520 f523 a060 f723 a064 f923 a068 fb23 a06c fd23 a070 ff23 a074 7fff ffed 0100 0000 ff03 a074 fd03 a070 8da0 09de 8da0 0026
1554600 bfa0 0027 1080 0047 bda0 0026 d11a a2f0 81af 8ac8 0100 0000 3d80 0019 1100 03cc 2100 03cc d51c 22e8 99a7 88ca d923 a078
1554660 d0f3 a078 db23 a078 d203 a078 f523 a060 f723 a064 f923 a068 fb23 a06c fd23 a070 ff23 a074 7fff ffcd 0100 0000 dd1c 22e8
1554740 ff03 a074 fd03 a070 a1a7 98ce a5a4 0340 bfa0 0033 1080 002b bda0 0032 c11a 22f8 f11a 22f8 bba0 0021 b9a0 0020 1b00 03cc
1555020 e91b 62e0 ada7 88d4 2300 03cc a214 6258 ba10 2038 2500 03cc b610 2007 8090 001b a414 a218 b807 4011 ba07 4012 bfa0 0039
1555100 bda0 0038 b7a0 0037 0680 0012 b5a0 0036 85a7 895a c907 4000 cb07 6004 d507 0000 d707 2004 8da0 8844 91a7 095a b6a6 e001
1555160 ba27 6008 b827 2008 99a2 084a bfa0 0027 bda0 0026 bba0 002d 1cbf fff2 b9a0 002c 9da7 89dc 9da0 002e bfa0 002f bda0 002e
1555240 81a0 003e 83a0 003f 81c7 e008 81e8 0000 9de3 bf80 f027 a044 f227 a048 9010 0018 7fff fe8c 9210 0019 c13f bff8 c11f bff8
1555320 81c7 e008 81e8 0000 9de3 bf80 f027 a044 131f fc00 b00e 0009 80a6 0009 9010 2001 1280 0003 f227 a048 9010 2000 8090 0008
1555400 3280 0009 d107 a044 c507 a044 c707 a048 1100 03cc c11a 2350 89a0 0842 1080 005b c93f bff8 d307 a048 1300 03cc cd1a 63d8
1555460 81aa 0ac6 0100 0000 3d80 0041 c907 a044 d207 a048 4000 0f32 d007 a044 ba10 0008 8090 001d 3680 0004 1700 03d2 ba07 6001
1555540 1700 03d2 c022 e370 c92b a044 f803 a044 1930 0000 982f 000c d823 a044 c90b a044 fa23 a060 d3c3 a060 95a0 1909 d007 a044
1555620 d207 a048 9420 001d b937 201e d53f bff0 4000 0f7f b80f 2003 c327 a048 c127 a044 d007 a044 4000 0411 d207 a048 e11f bff0
1555700 f11f bff0 1500 03cc d91a a3c0 9da3 0940 1700 03cc e51a e3d0 1900 03cc 8090 001c a9a4 0952 ada5 084e ed3f bfe8 f51b 23c8
1555760 b9a6 095a fd1f bfe8 bda7 885c 0280 000e fd3f bfe8 b80f 2003 1700 03d2 f822 e370 c92b a044 d003 a044 1930 0000 902a 000c
1556040 b92f 201e b817 0008 f823 a044 c90b a044 0100 0000 1080 0014 c11f bfe8 cb07 a048 1b00 03cc c51b 63d8 81a9 0a42 0100 0000
1556120 0380 0007 d207 a048 d007 a044 9810 2012 9610 0009 1080 0006 9410 0008 d007 a044 9610 0009 9410 0008 9810 2013 4000 11af
1556200 0100 0000 c13f bff8 c11f bff8 81c7 e008 81e8 0000 0000 0000 1b00 03cd 9a13 6018 d023 6000 d223 6004 d423 6008 d623 600c
1556260 c11b 6000 c51b 6008 81a0 0120 85a0 0122 81a8 0a42 de23 6028 1920 0000 942a 800c d423 6008 980a 000c 901a 000c d823 602c
1556340 d023 6000 0f80 0046 191f fc00 80a2 000c 0280 0045 191f f7ff 9813 23ff 0980 0012 80a2 800c 1480 0010 1900 0800 85a0 8842
1556420 c53b 6020 d403 6020 d603 6024 4000 0047 0100 0000 1b00 03cd 9a13 6018 c51b 6008 d403 6008 d603 600c c13b 6000 d003 6000
1556500 d203 6004 1900 0800 80a2 800c 1680 0014 0100 0000 89a0 0840 80a2 000a 1280 0004 80a2 400b 0280 002a 0100 0000 81a9 0a42
1556560 0100 0000 1b80 001b 0100 0000 81a0 08c2 89a0 0840 81a9 0a42 0100 0000 0980 0015 0100 0000 1080 0013 81a0 08c2 c91b 6018
1556640 89a1 0942 80a2 000a 1280 0004 80a2 403b 0280 0017 0100 0000 81a8 0a44 0100 0000 1b80 0008 0100 0000 81a0 08c2 81a8 0a44
1556720 0100 0000 0980 0003 0100 0000 81a0 08c2 d403 602c 8090 000a 0280 0003 de03 6028 81a0 00a0 81c3 e008 0100 0000 81c3 e008
1557000 81a0 0842 81c3 e008 81a0 08c0 d803 602c 8090 000c c11b 6010 0280 0003 de03 6028 81a0 00a0 81c3 e008 0100 0000 10bf ff9b
1557060 0100 0000 0000 0000 1b00 03cd 9a13 6078 de23 6010 191f fc00 9e0a 000c 80a3 c00c 1280 000c 0100 0000 d023 4000 d223 6004
1557140 d423 6008 d623 600c c11b 4000 c51b 6008 81a0 08c2 de03 6010 81c3 e008 81a0 08c0 9e0a 800c 80a3 c00c 1280 0010 1901 0000
1557220 d023 4000 d223 6004 c11b 4000 193f fc00 982a 800c 8093 000b 0280 0006 de03 6010 d423 4000 d623 6004 c51b 4000 81a0 0842
1557300 81c3 e008 0100 0000 80a3 c00c c023 6020 1480 0015 c023 6024 d423 6008 d623 600c c11b 6018 c51b 6008 85a0 0122 85a0 0942
1557360 c53b 6008 d403 6008 d603 600c 9810 2001 d823 6024 8092 800b 1280 0007 d823 6020 81a0 89c2 81a0 0020 de03 6010 81c3 e008
1557440 0100 0000 c92b 603c c93b 6040 cd3b 6048 d803 603c 1f32 0000 982b 000f 1f10 0000 9813 000f d823 6038 c90b 6038 1f20 0000
1557520 980a 000f d823 6014 902a 000f 942a 800f 1f3e 0000 980a c00f d023 4000 d223 6004 d423 6008 d623 600c d423 6028 d823 602c
1557600 c11b 4000 c51b 6008 81a8 0a42 171f fc00 1f00 6400 920a 000b 960a 800b 9822 400b 0980 0023 98a3 000f 0d80 000a 0100 0000
1557660 d803 6014 c023 6004 d823 4000 de03 6010 c90b 603c c11b 4000 81c3 e008 0100 0000 0480 0006 0100 0000 9803 000a d823 6008
1557740 c51b 6008 d823 6028 8da0 09c2 8da0 0026 c91b 6028 8da0 1a46 cd23 6038 8da0 1906 d423 6008 d423 6028 85a0 88c4 89a1 0946
1560020 81a0 08c4 85a0 8946 81a0 08c2 c13b 4000 c51b 6008 10bf ffd9 d003 4000 d803 6020 988b 000c 0280 0007 c023 6020 cd1b 6018
1560100 81a0 0946 c13b 4000 10bf ffd0 d003 4000 d803 6024 988b 000c d803 6014 0280 0004 0100 0000 cd1b 6030 81a0 0946 988b 000c
1560160 0280 0003 c91b 6040 81a0 00a0 de03 6010 d003 6038 c90b 603c cd1b 6048 81c3 e008 0100 0000 0000 0000 9de3 bf68 f027 a044
1560240 c507 a044 c107 a044 f227 a048 c707 a048 c307 a048 81a8 0a42 0100 0000 3380 0009 f023 a044 c907 a044 cb07 a048 cd07 a044
1560320 cf07 a048 91a1 0846 1080 008a d13f bff8 c103 a044 81a0 0120 f223 a048 c303 a048 c13f bff0 dd1f bff0 1100 03cd d51a 20c8
1560400 d53f bfe8 1300 03cd d91a 60e8 81ab 8acc 0100 0000 0b80 0042 bb36 201f e11f bff0 1500 03cd e51a a0c8 81ac 0ad2 0100 0000
1560460 3d80 0015 cd1f bff0 e91f bff0 ed1f bff0 b1a5 0856 f123 a060 d003 a060 f323 a060 4000 0458 d203 a060 1100 03cd f51a 20d0
1560540 b9a0 085a 1b00 03cd fd1a 20d0 c51b 60c8 81a7 89dc 81a0 0020 89a0 88c0 1080 0057 c93f bfe8 1f00 03cd d11b e0d8 81a9 8ac8
1560620 0100 0000 3d80 0016 f51f bff0 d51f bff0 d91f bff0 95a0 00aa 9da2 88cc 2100 03cd dd23 a060 d003 a060 df23 a060 4000 043d
1560700 d203 a060 c13f bfe0 ed1f bfe0 e51c 20d0 e11f bfe0 a9a4 0852 ada0 00b6 b1a5 89d4 b1a0 0038 1080 003d f13f bfe8 2300 03cd
1560760 f91c 60e0 bda6 885c fd23 a060 d003 a060 ff23 a060 4000 0042 d203 a060 c307 a048 c107 a044 1080 003b c13f bff8 d007 bff0
1561040 131f fc00 900a 0009 80a2 0009 1280 0003 9010 2001 9010 2000 8090 0008 3280 0013 80a7 6001 1100 03cd c51a 20f0 c523 a060
1561120 d003 a060 c723 a060 d203 a060 d407 a044 d223 a048 c303 a048 1320 0000 940a 8009 902a 0009 9012 000a d023 a044 c103 a044
1561200 1080 0020 c13f bff8 3280 000b e91f bfe8 d51f bfe8 95a0 00aa 1100 03cd cd1a 20d8 c91a 20d8 91a1 0946 99a2 8848 1080 0008
1561260 d93f bfd8 1100 03cd e11a 20d8 dd1a 20d8 a5a3 8950 ada5 08d2 ed3f bfd8 f11f bfd8 1080 000c f13f bff8 80a7 6001 3280 0006
1561340 f91f bfe8 f51f bfe8 b5a0 00ba 1080 0003 f53f bfd0 f93f bfd0 fd1f bfd0 fd3f bff8 c11f bff8 81c7 e008 81e8 0000 81c3 e008
1561420 900c 2001 0000 0000 9de3 bfc0 f027 a044 c107 a044 f227 a048 c307 a048 81c7 e008 81e8 0000 9de3 bf70 f427 a04c c507 a04c
```

```
1561500 c107 a04c f627 a050 c707 a050 c307 a050 81a8 0a42 f227 a048 0380 000a f027 a044 c907 a044 cb07 a048 cd07 a044 cf07 a048
1561560 81a9 0a46 0100 000c 3380 0009 e107 a04c d107 a04c d307 a050 d507 a044 d707 a048 99a2 084a 1080 0129 d93f bff8 e307 a050
1561640 1100 03cd dd1a 21f0 81ac 0a4e b936 201f 0380 0007 bb36 a01f 9210 0019 4000 0123 9010 0018 1080 011d c13f bff8 e507 a044
1561720 e707 a048 1700 03cd e91a e1e8 81ac 8a54 9207 001d c380 002e ba02 401d ed07 a04c ef07 a050 1900 03cd f11b 21e8 81ad 8a58
1562000 0100 0000 2380 001b 80a7 6003 9810 2003 9610 0019 9410 0018 9210 001b 4000 0fc7 9010 001a 1080 0105 c13f bff8 f507 a044
1562060 f707 a048 1080 0101 f53f bff8 f907 a044 fb07 a048 1080 00fd f93f bff8 1b00 03cd fd1b 61c8 1080 00f9 fd3f bff8 1f00 03cd
1562140 c11b e1c8 81a0 00a0 1080 00f4 c13f bff8 1880 000b 912f 6002 1300 03b3 9212 611c d002 0009 81c2 0000 0100 0000 000e ccbc
1562220 000e cccc 000e ccdc 000e ccec c507 a04c c707 a050 2100 03cd c91c 21e8 81a8 8a44 0100 0000 2380 000f d007 a04c 80a7 2001
1562300 3280 0007 2500 03cd 2300 03cd cd1c 61c0 8da0 00a6 1080 0004 cd3f bff0 d11c a1c0 d13f bff0 d51f bff0 1080 00d4 d53f bff8
1562360 131f fc00 900a 0009 80a2 0009 1280 0003 9010 2001 9010 2000 8090 0008 1280 004d d007 a044 131f fc00 900a 0009 80a2 0009
1562440 1280 0003 9010 2001 9010 2000 0090 0008 0280 0024 80a7 6003 1880 0041 912f 6002 1300 03b3 9212 61e4 d002 0009 81c2 0000
1562520 0100 0000 000e ce84 000e ce94 000e cea8 000e ceb8 2700 03cd d91c e1b8 1080 00b3 d93f bff8 2900 03cd dd1d 21b8 9da0 00ae
1562600 1080 00ae dd3f bff8 2d00 03cd e51d a1b8 2b00 03cd e11d 61f8 a9a4 0952 1080 00a7 e93f bff8 3100 03cd f11e 21b8 2f00 03cd
1562660 ed1d e200 b5a5 8958 1080 00a0 f53f bff8 1880 001f 912f 6002 1300 03b3 9212 626c d002 0009 81c2 0000 0100 0000 000e cdf4
1562740 000e ce04 000e ce18 000e ce34 1080 0015 d007 a044 3300 03cd f91e 61e8 1080 008f f93f bff8 3500 03cd fd1e a1e8 bda0 00be
1563020 1080 008a fd3f bff8 3700 03cd c11e e1c8 1080 0086 c13f bff8 1100 03cd c51a 21c8 85a0 00a2 1080 0081 c53f bff8 d007 a044
1563100 131f fc00 900a 0009 80a2 0009 1280 0003 9010 2001 9010 2000 8090 0008 3280 000f d007 a04c 80a7 2001 3280 0007 1500 03cd
1563160 1300 03cd c91a 61c0 89a0 00a4 1080 0004 c93f bfe8 cd1a a1c0 cd3f bfe8 d11f bfe8 1080 006a d13f bff8 d207 a050 d023 a044
1563240 c103 a044 81a0 0120 c127 a04c d223 a048 c303 a048 c327 a050 d007 a044 d207 a048 d023 a044 c103 a044 81a0 0120 c127 a044
1563320 d223 a048 c303 a048 c327 a048 1700 03d0 1602 e180 1b00 03cd 9a13 61d0 972a e003 9602 c00d d702 e004 d502 c000 d53f bfe0
1563400 d207 a050 4000 0c42 d007 a04c d207 a048 b610 0008 4000 0c3e d007 a044 b822 001b 80a7 203c 2480 000b 80a7 6001 dd1f bfe0
1563460 2300 03cd d91c 6208 a1a3 094e 2500 03cd e51c a1c0 a9a4 8850 1080 0030 e93f bfd8 2480 0009 f107 a044 80a7 3fc4 3680 0006
1563540 f107 a044 2700 03cd ed1c e210 1080 0027 ed3f bfd8 f307 a048 f507 a04c f707 a050 b9a6 09da b9a0 003c f923 a060 d003 a060
1563620 fb23 a060 4000 002d d203 a060 1080 001b c13f bfd8 fd1f bfd8 1080 0024 fd3f bff8 d207 bfdc 7fff fed9 d007 bfd8 81a0 00a0
1563700 1080 001e c13f bff8 c11f bfd8 c51f bfe0 89a0 08c2 2900 03cd cd1d 21c8 91a1 88c4 1080 0016 d13f bff8 d51f bfd8 d91f bfe0
1563760 9da2 88cc 2b00 03cd e11d 61c8 a5a3 88d0 1080 000e e53f bff8 80a7 6003 1880 000b 912f 6002 1300 03b4 9212 60b8 d002 0009
1564040 81c2 0000 0100 0000 000e d034 000e d040 000e d058 000e d078 c11f bff8 81c7 e008 81e8 0000 0000 0000 1b00 03cd 9a13 6348
1564120 d023 6000 d223 6004 c11b 6000 1920 0000 980a 000c 901a 000c 170f f700 80a2 000b 0680 000f 170f d400 81a0 0120 170f fcc0
1564200 80a2 000b 0680 0051 170f f980 1710 c0e0 80a2 000b 0680 0033 c51b 6028 d603 6058 80a2 000b 0680 0018 c51b 6020 171f fc00
1564260 80a2 000b 0680 0009 0100 0000 1480 0005 0100 0000 8090 0009 0280 0004 0100 0000 81c3 e008 81a0 0840 c51b 6060 85a0 08c2
1564340 1700 03cd 9612 e238 c11a e018 8090 000c 0280 0003 0100 0000 81a0 00a0 81c3 e008 0100 0000 85a0 00a2 81a0 89c0 81a0 0020
1564420 1700 03d0 9612 e180 d602 c000 1100 03cd 9012 22f0 1300 03cd 9212 6238 1500 03cd 9412 a278 80a2 e002 1280 0006 0100 0000
1564500 1100 03cd 9012 2298 1500 03cd 9412 a258 9202 6018 9402 a018 1080 004d 0100 0000 89a0 08c2 8da0 8940 d11b 6020 8da2 0846
1564560 81a1 09c6 81a0 0020 1700 03d0 9612 e180 1602 c000 1100 03cd 9012 22f0 1300 03cd 9212 6238 1500 03cd 9412 a278 80a2 e002
1564640 1280 0006 0100 0000 1100 03cd 9012 2298 1500 03cd 9412 a258 9202 6010 9402 a010 1080 0033 0100 0000 80a2 000b 1680 001a
1564720 c51b 6020 c91b 6030 8da0 0844 91a1 0940 85a2 08c2 81a0 89c6 81a0 0020 1700 03d0 9612 e180 d602 c000 1100 03cd 9012 22f0
1565000 1300 03cd 9212 6238 1500 03cd 9412 a278 80a2 e002 1280 0005 0100 0000 1100 03cd 9012 2298 1500 03cd 9412 a258 1080 0018
1565060 0100 0000 89a0 8840 8d3c 08c2 31a1 89c4 81a0 0020 1700 03d0 9612 e180 d602 c000 1100 03cd 9012 22f0 1300 03cd 9212 6238
1565140 1500 03cd 9412 a278 80a2 e002 1280 0006 0100 0000 1100 03cd 9012 2298 1500 03cd 9412 a258 9202 6008 9402 a008 d823 6088
1565220 1920 0000 85a0 0940 c123 6090 d603 6090 962a c00c d803 6078 80a2 c00c 1680 000b d803 6088 c91a 2010 89a0 8944 cd1a 2008
1565300 89a1 8844 89a0 8944 cd1a 0000 89a1 8844 1080 000b 89a0 8944 c91a 2050 9610 2048 89a0 8944 cd1a 000b 89a1 8844 96a2 e008
1565360 16bf fffc 0100 0000 89a0 8944 89a0 0944 cd1a 8000 89a1 88c4 89a0 0844 c51a 4000 81a0 8844 8090 000c 0280 0003 0100 0000
1565440 81a0 00a0 81c3 e008 0100 0000 80a2 000b 1680 001b 170f 8800 80a2 000b 1680 0005 170f c400 c51b 6058 81c3 e008 85a0 0842
1565520 85a0 0940 1900 03cd 9813 22f0 80a2 000b 1680 0007 0100 0000 c91b 0000 85a1 0942 85a0 0942 81c3 e008 81a0 08c2 c91b 2008
1565600 89a0 8944 cd1b c000 89a1 8844 85a0 0942 99a1 0942 81c3 e008 81a0 08c4 85a0 0940 1700 03d0 9612 e180 d602 c000 1900 03cd
1565660 9813 22f0 80a2 e002 1280 0004 0100 0000 1900 03cd 9813 2298 c91b 2050 9410 2048 89a0 8944 cd1b 000a 89a1 8844 94a2 a008
1565740 16bf fffc 0100 0000 89a0 9944 89a0 0944 81c3 e008 81a0 08c4 1b00 03ce 9a13 6038 d023 6000 d223 6004 191f fc00 948a 000c
1566020 1280 0019 80a2 800c 1720 0000 942a 000b 8092 8009 0280 0087 8090 0008 0680 0076 c51b 6008 c11b 6000 81a0 0942 c13b 6000
1566100 d003 6000 808a 000c 0280 007e d403 6040 9402 000a 9532 a014 9622 a3ff 972a e014 9022 000b d023 6000 c51b 6028 1080 0012
1566160 92a2 a435 1280 0006 8090 0008 c51b 6058 c11b 6000 81c3 e008 81a0 8840 0680 005e d403 6040 9402 000a 9532 a014 92a2 a3ff
1566240 9280 c005 c51b 6028 972a 6014 9022 000b d023 6000 c11b 6000 81a0 08c2 d223 6044 c91b 6010 85a1 0940 c13b 6050 d11b 6060
1566320 91a0 0848 1003 6050 1720 0000 902a 000b 190f 8800 80a2 000c 1680 0019 85a0 0942 8090 0009 1280 000c 0100 0000 8090 0008
1566400 1280 0004 0100 0000 81c3 e008 c11b 6020 81a0 08c2 c91b 6030 cd1b 6038 81c3 e008 89a1 0846 cd03 6044 8da0 1906 d11b 6038
1566460 91a2 0946 d51b 6030 91a0 88c8 95a1 894a 81a2 08c0 81c3 e008 81a2 88c0 89a0 09c8 89a0 0024 190f d9a6 9813 2098 1700 03ce
1566540 9612 e000 91a1 0944 80a2 000c 1680 c038 0100 0000 d51a e008 95a2 8948 d91a c000 95a3 084a 1080 000b 95a2 094a d51a e030
```

```
1566620  9810 2028 95a2 094a d91a c00c 95a3 084a 98a3 2008 16bf fffc 0100 0000 95a2 094a 8090 0009 1280 0007 0100 0000 95a0 884a
1566700  95a1 094a 95a0 88ca 81c3 e008 81a0 09ca cd03 6044 8da0 1906 d91b 6038 99a1 894c 95a0 884a 95a1 094a 95a3 084a 95a0 88ca
1566760  d91b 6030 99a1 894c 81a2 88c0 81c3 e008 81a3 08c0 1700 03ce 9612 e0a0 de22 c000 d003 6000 d203 6004 9410 0008 9610 0009
1567040  9810 2011 4000 0d45 0100 0000 1100 03ce 9012 20a0 de02 0000 81c3 e008 0100 0000 1700 03ce 9612 e0a0 de22 c000 d003 4000
1567120  d203 6004 9410 0008 9610 0009 9810 2010 4000 cd36 0100 0000 1100 03ce 9012 20a0 de02 0000 81c3 e008 0100 0000 0000 0000
1567200  9de3 bf78 f023 a044 c103 a044 81a0 0120 f223 a048 c303 a048 c13f bff8 d007 bff8 131f fc00 900a 0009 80a2 0009 f227 a048
1567260  f027 a044 1280 0003 9010 2001 9010 2000 8090 0008 3280 0007 d11f bff8 c11f bff8 c51f bff8 89a0 0842 1080 0073 c93f bff0
1567340  1100 03ce cd1a 2168 81aa 0ac6 0100 0000 3980 0020 d51f bff8 d207 bffc 4000 00ed d007 bff8 c13f bfe8 d91f bfe8 1100 03ce
1567420  d51a 2170 9da2 884c dd3f bff8 e51f bff8 e11a 2170 81ac 8a50 0100 0000 3380 000f cd1f bff8 e91f bff8 ed1f bff8 b1a5 0856
1567500  f51f bfe8 1700 03ce f91f bfe8 bda6 895c c51a e170 81a7 d9d8 81a0 0020 89a0 8840 c93f bff8 cd1f bff8 1080 004f cd3f bff0
1567560  1900 03ce d11b 2178 81aa 8ac8 0100 0000 3980 0012 f51f bff8 d207 bffc 4000 02a3 d007 bff8 c13f bfe8 dd1f bfe8 e51f bfe8
1567640  1b00 03ce d91b 6170 a1a3 09ce a1a0 0030 1f00 03ce ed1b e180 a9a4 8850 b1a5 8954 1080 0039 f13f bff0 2100 03ce f91c 2150
1567720  81ae 8adc 0100 0000 2b80 000a e11f bff8 d207 bffc 4000 028d d007 bff8 2300 03ce fd1c 6180 85a7 8940 1080 002b c53f bff0
1570000  1100 03ce d51a 2188 c91a 2188 2b00 03ce d91d 60d8 9da2 894c 2700 03ce cd1c e0e0 a5a4 08ce 91a1 0946 a9a4 88c8 e923 a060
1570060  d003 a060 eb23 a060 4000 0278 d203 a060 c13b a068 d003 a068 d203 a06c 4000 0a54 9410 23ff c13f bff8 d007 bff8 131f fc00
1570140  900a 0009 80a2 0009 1280 0003 9010 2001 9010 2000 8090 0008 3280 000a ed1f bff8 d207 a048 d007 a044 9610 0009 9410 0008
1570220  4000 0caa 9810 2005 c13f bff8 ed1f bff8 ed3f bff0 c11f bff0 81c7 e008 81e8 0000 9de3 bf78 f027 a044 131f fc00 b00e 0009
1570300  80a6 0009 9010 2001 1280 0003 f227 a048 9010 2000 8090 0008 3280 0009 d007 a044 c107 a044 c307 a048 c507 a044 c707 a048
1570360  89a0 0842 1080 006b c93f bff8 d207 a048 d023 a044 c103 a044 81a0 0120 d223 a048 c303 a048 c13f bff0 cd1f bff0 1100 03ce
1570440  d11a 2238 81a9 8ac8 0100 0000 3980 0020 fd1f bff0 d207 bff4 4000 005e d007 bff0 c13f bfe8 d91f bfe8 e11f bfe8 e91f bfe8
1570520  1300 03ce d51a 6250 9da2 884c 1500 03ce f11a a258 a5a4 09ce a5a0 0032 ada5 0852 b5a5 8958 f523 a060 d003 a060 f723 a060
1570600  d203 a060 d407 a044 d223 a048 c303 a048 1320 0000 940a 8009 902a 0009 9012 000a d023 a044 1080 002b c103 a044 1700 03ce
1570660  f91a e260 81af 8a1c 0100 0000 3980 0022 d207 a048 d91f bff0 1100 03ce cd1a 2268 c11a 2268 2100 03ce d11c 21c0 95a1 8948
1570740  1b00 03ce c51b 61c8 9da3 08ca 89a0 0942 a1a3 88c4 e123 a060 d003 a060 e323 a060 4000 0206 d203 a060 c13b a068 d003 a068
1571020  d203 a06c d407 a044 d223 a048 c303 a048 c327 a048 1320 0000 940a 8009 902a 0009 9012 000a d023 a044 c103 a044 c127 a044
1571100  d207 a048 d007 a044 4000 09d5 9410 23ff c13f bff0 d907 bff0 131f fc00 900a 0009 80a2 0009 1280 0003 9010 2001 9010 2000
1571160  8090 0008 3280 000a e51f bff0 d207 a048 d007 a044 9610 0009 9410 0008 4000 0c2b 9810 2019 c13f bff0 e51f bff0 e53f bff8
1571240  c11f bff8 91c7 e008 81e8 0000 0000 0000 9de3 bf68 f027 a044 131f fc00 b00e 0009 80a6 0009 9010 2001 1280 0003 f227 a048
1571320  9010 2000 8090 0008 3280 001c d007 a044 c107 a044 c307 a048 c507 a044 c707 a048 81a8 0a42 0100 0000 2380 000b d107 a044
1571400  cd07 a044 cf07 a048 1100 03ce c91a 2380 81a9 8ac4 0100 0000 3d80 0009 1300 03ce d107 a044 d307 a048 d507 a044 d707 a048
1571460  99a2 084a 1080 0170 d93f bff8 dd1a 6388 1080 016d dd3f bff8 9132 201f 8090 0008 2280 0071 c907 a044 e507 a044 e707 a048
1571540  1500 03ce e11a a390 81ac 8ad0 0100 0000 3d80 0025 d107 a044 ed07 a044 ef07 a048 1700 03ce e91a e398 81ad 8ad4 0100 0000
1571620  3d80 0010 1500 03ce f107 a044 f307 a048 1900 03ce f51b 22f8 b9a6 085a f923 a060 d003 a060 fb23 a060 4000 0195 d203 a060
1571700  ff07 a048 fd07 a044 1080 014b fd3f bff8 c11a a380 c123 a060 d403 a060 c323 a060 d603 a060 d007 a044 4000 0146 d207 a048
1571760  c707 a048 c507 a044 89a0 8840 1080 013e c93f bff8 d307 a048 1b00 03ce cd1b 63a0 81aa 0ac6 0100 0000 3d80 0021 e107 a044
1572040  d507 a044 d707 a048 1f00 03ce d91b e2a0 9da2 894c 1100 03ce dd3f bff0 e51a 22a8 e11f bff0 a9a4 0852 ed1f bff0 e93f bfe8
1572120  f11f bfe8 b5a5 88d8 d207 bfec f91a 22a8 d007 bfe8 bda6 885c fd3f bfe0 d407 bfe0 4000 0124 d607 bfe4 c51f bfe8 89a0 8840
1572200  1100 03ce cd1a 23a8 d51a 23a8 91a1 8944 99a2 08ca 1080 0118 d93f bff8 e307 a048 2900 03ce dd1d 23b0 81ac 0ace 0100 0000
1572260  3d80 000a f107 a044 d207 a048 4000 0157 d007 a044 2b00 03ce e51d 63b8 a9a0 08d2 1080 0109 e93f bff8 f307 a048 1100 03ce
1572340  ed1a 23c0 b5a5 8858 2f00 03ce 2d00 03ce f523 a060 d003 a060 f723 a060 4000 0144 d203 a060 fd1d e300 f91d a3b8 1080 00f9
1572420  81a7 88dc cb07 a048 3100 03ce c51e 23c8 81a9 0ac2 0100 0000 3980 0025 f507 a044 d107 a044 d307 a048 3300 03ce cd1e 63d0
1572500  81aa 0ac6 0100 0000 3980 0010 1500 03ce d507 a044 d707 a048 3500 03ce d91e a2f8 9da2 88cc d123 a060 d003 a060 df23 a060
1572560  4000 0127 d203 a060 e307 a048 e107 a044 1080 00dd e13f bff8 e51a a380 e523 a060 d403 a060 e723 a060 d603 a060 d007 a044
1572640  4000 00d8 d207 a048 eb07 a048 e907 a044 ada5 0840 1080 00d0 ed3f bff8 f707 a048 3700 03ce f11e e3d8 81ae 8ad8 0100 0000
1572720  3980 0041 dd07 a044 f907 a044 fb07 a048 e907 a044 eb07 a048 3900 03ce fd1f 22a0 81a7 08de 1300 03ce 1500 03ce c13f bff0
1573000  c91a 62a8 c51f bff0 8da0 88c4 d11f bff0 cd3f bfe8 d51f bfe8 99a2 08ca dd1a 62a8 a1a3 08ce e13f bfe0 e51a a3e0 81ad 0ad2
1573060  0100 0000 3980 0014 d607 bfe4 f11f bfe8 1700 03ce ed1a e3a8 b5a6 0856 d607 bfe4 d407 bfe0 d207 bfec d007 bfe8 f727 a048
1573140  f527 a044 4000 00a7 0100 0000 fb07 a048 f907 a044 b9a7 0840 fb27 a048 1080 000f f927 a044 d407 bfe0 d207 bfec 4000 009d
1573220  d007 bfe8 fd1f bfe0 bda7 8840 1900 03ce fd3f bfe8 c51f bfe8 c11b 23a8 89a0 0842 cb27 a048 c927 a044 cd07 a044 cf07 a048
1573300  d107 a044 d307 a048 95a1 8848 1080 008a d53f bff8 df07 a048 1b00 03ce d91b 63e8 81ab 8acc 0100 0000 3980 0072 ed07 a044
1573360  1100 03ce e11a 23a8 e123 a060 d003 a060 e323 a060 eb07 a048 e907 a044 d203 a060 d407 a044 d223 a048 c303 a048 1320 0000
1573440  940a 8009 902a 0009 9012 000a d023 a044 c103 a044 1f00 03ce e51b e328 ada4 8954 2100 03ce 2300 03ce 2500 03ce b1a5 8840
1573520  b3a0 1a58 f323 a064 fa03 a064 fa23 a060 f503 a060 b9a0 191a cb07 a048 c907 a044 f93f bfd0 c11c 22a0 fd1f bfd0 85a7 8940
1573600  d11f bfd0 8da1 09c2 cd3f bff0 d51c 62a8 99a2 094a dd1f bff0 e91f bff0 d93f bfd8 e11f bfd8 a5a3 88d0 f51f bfd8 e53f bfe8
1573660  ed1f bfe8 b1a5 08d6 b9a6 08da f93f bfe0 e404 a340 80a7 4012 1480 0016 1300 03ce 9212 6330 d0c2 4000 d202 6004 4000 0870
```

| | | | | | | | | | | | | | | | | | | | | | | | | |
|---|---|---|---|---|---|---|---|---|---|---|---|---|---|---|---|---|---|---|---|---|---|---|---|---|
| 1573740 | 9420 | 001d | 2700 | 03ce | fd1c | e330 | 85a7 | 88c0 | d007 | bfe8 | d207 | bfec | d407 | bfe0 | d637 | bfe4 | c727 | a048 | c527 | a044 | 4000 | 003e | 0100 | 0000 |
| 1574020 | c91f | bfe8 | 89a1 | 0840 | 1080 | 001a | c93f | bfe8 | 9212 | 6330 | d002 | 4000 | d202 | 6004 | 4000 | 085c | 9420 | 001d | c13b | a060 | d007 | bfe8 | d207 | bfec |
| 1574100 | d407 | bfc0 | 4000 | 002f | d607 | bfe4 | cd1b | a060 | 91a0 | 08c6 | d51f | bfe8 | 2900 | 03ce | d327 | a048 | d127 | a044 | db07 | a048 | d907 | a044 | 9913 | 084a |
| 1574160 | db27 | a048 | d927 | a044 | dd1d | 2330 | dd3f | bfe8 | e107 | a044 | e307 | a048 | e51f | bfe8 | a9a4 | 0852 | 9410 | 001d | e923 | a060 | d003 | a060 | eb23 | a060 |
| 1574240 | 4000 | 083f | d203 | a060 | 1080 | 0013 | c13f | bff8 | ef07 | a048 | 2b00 | 03ce | f11d | 6318 | 81ad | 8ad8 | 0100 | 0000 | 0b80 | 0009 | d207 | a048 | 4000 | 0053 |
| 1574320 | d007 | a044 | 2d00 | 03ce | f51d | a3b8 | b9a0 | 08da | 1080 | 0005 | f93f | bff8 | 4000 | 004c | d007 | a044 | c13f | bff8 | c11f | bff8 | 81c7 | e008 | 81e8 | 0000 |
| 1574400 | 9de3 | bf78 | f027 | a044 | e507 | a044 | f227 | a048 | e707 | a048 | 81a4 | 8952 | f427 | a04c | dd07 | a04c | f627 | a050 | df07 | a050 | bba0 | 0021 | b9a0 | 0020 |
| 1574460 | 1300 | 03ce | c51a | 6350 | 89a7 | 0942 | 1500 | 03ce | cd1a | a348 | 1700 | 03ce | d91a | e360 | 1900 | 03ce | 1100 | 03ce | e11a | 2378 | 91a1 | 8844 | 81a7 | 094c |
| 1574540 | c51b | 2358 | 1b00 | 03ce | 95a7 | 0948 | 89a0 | 8840 | 8da7 | 0944 | bfa0 | 002b | bda0 | 002a | 85a7 | 885e | 91a4 | 895e | b7a0 | 0027 | b5a0 | 0026 | 95a4 | 8950 |
| 1574620 | b3a0 | 0029 | b1a0 | 0028 | 99a6 | 88d8 | bfa0 | 0023 | bda0 | 0022 | afa0 | 002b | ada0 | 002a | 81a5 | 88cc | 89a7 | 8858 | aba0 | 0021 | a9a0 | 0020 | 91a5 | 8954 |
| 1574700 | d91b | 6370 | 8da6 | 88c4 | 81a3 | 08d4 | 95a2 | 08c6 | 85a2 | 89c0 | 85a0 | 0022 | 89a0 | d84e | 95a7 | 0950 | 8da4 | 8944 | 91a3 | 8846 | bfa0 | 0029 | bda0 | 0028 |
| 1574760 | 99a2 | 885e | bba0 | 002d | b9a0 | 002c | 83a0 | 003d | 81a0 | 003c | 81c7 | e008 | 81e8 | 0000 | 81c3 | e008 | 9000 | 2001 | 0000 | 0000 | 1b00 | 03cf | 9a13 | 6038 |
| 1575040 | d223 | 6004 | d023 | 6000 | c11b | 6000 | 1720 | 0000 | 962a | 000b | 190f | f58b | 9813 | 2242 | 80a2 | c00c | 0680 | 0009 | 190f | b400 | 1480 | 001b | 193f | be8e |
| 1575120 | 9813 | 21ef | 80a2 | 400c | 1880 | 0017 | 0100 | 0000 | 190f | b400 | 80a2 | c00c | 1480 | 0064 | 9210 | 2000 | 190f | 8c00 | c91b | 6020 | 89a1 | 0840 | 80a2 | c00c |
| 1575200 | 1480 | 0006 | 0100 | 0000 | c51b | 6040 | 81a0 | 0842 | 81c3 | e008 | 0100 | 0000 | 85a0 | 0940 | c91b | 6060 | 89a1 | 0942 | 81a0 | 0844 | c51b | 6040 | 81c3 | e008 |
| 1575260 | 81a0 | 8840 | d803 | 6080 | 80a2 | 000c | 0680 | 001c | d803 | 6084 | 1480 | 0004 | 80a2 | 400c | 0880 | 003c | c51b | 6068 | 171f | fc00 | 940a | 000b | 80a2 | 800b |
| 1575340 | 1280 | 0004 | 0100 | 0000 | 81c3 | e008 | 81a0 | 0840 | 1700 | 03cf | 9612 | e0cc | de22 | c000 | d003 | 6000 | d203 | 6004 | 9410 | 0008 | 9610 | 0009 | 9810 | 2006 |
| 1575420 | 4000 | 0a0a | 0100 | 0000 | 1100 | 03cf | 9012 | 20cc | de02 | 0000 | 81c3 | e008 | 0100 | 0000 | 8090 | 0008 | 1680 | 0023 | c51b | 6068 | d803 | 6088 | 80a2 | 000c |
| 1575500 | 0680 | 001f | 85a0 | 00a2 | 1480 | 0005 | d803 | 608c | 80a2 | 400c | 0880 | 001a | 0100 | 0000 | 171f | fc00 | 940a | 000b | 80a2 | 800b | 1280 | 0006 | 81a0 | 0120 |
| 1575560 | c51b | 6040 | 81a0 | 89c0 | 81c3 | e008 | 81a0 | 0020 | 1700 | 03cf | 9612 | e0cc | de22 | c000 | d003 | 6000 | d203 | 6004 | 9410 | 0008 | 9610 | 0009 | 9810 | 2007 |
| 1575640 | 4000 | 09e6 | 0100 | 0000 | 1100 | 03cf | 9012 | 20cc | de02 | 0000 | 81c3 | e008 | 0100 | 0000 | 89a0 | 0842 | cd1b | 6018 | 85a1 | 8944 | 91a0 | 1a42 | 89a0 | 0020 |
| 1575720 | 8ba0 | 0021 | 85a0 | 1908 | d123 | 6090 | c91b | 6028 | 89a1 | 0942 | 89a0 | 08c4 | cd1b | 6030 | 8da1 | 8942 | d203 | 6090 | 81a1 | 08c6 | 85a0 | 0940 | 1700 | 03cf |
| 1576000 | 9612 | e010 | 9810 | 2018 | d51a | e020 | 95a0 | 894a | d91a | c00c | 95a3 | 084a | 95a0 | 894a | 98a3 | 2008 | 16bf | fffc | 0100 | 0000 | 95a0 | 08ca | 99a0 | 094a |
| 1576060 | c51b | 6038 | 85a0 | 88ca | 85a3 | 09c2 | 85a0 | 0022 | 8090 | 0009 | 1280 | 0005 | d11b | 6040 | 81a0 | 0842 | 81c3 | e008 | 81a2 | 0840 | 80a2 | 63ff | 1480 | 0008 |
| 1576140 | 81a1 | 88c2 | 80a2 | 7c03 | 0680 | 0005 | 9010 | 2000 | 9602 | 63ff | 1080 | 0009 | 972a | e014 | 973a | 6001 | 9822 | 400b | 9602 | e3ff | 9803 | 23ff | 972a | e014 |
| 1576220 | 992b | 2014 | 9010 | 2001 | 81a1 | 08c0 | d623 | 6070 | c023 | 6074 | d823 | 6078 | c023 | 607c | 81a2 | 0840 | c51b | 6070 | 81a0 | 8940 | 8090 | 0008 | 0280 | 0004 |
| 1576300 | 0100 | 0000 | c51b | 6078 | 81a0 | 8940 | 81c3 | e008 | 0100 | 0000 | 0000 | 0000 | 1080 | 000c | 9410 | 2000 | 1080 | 000a | 9410 | 2001 | 1080 | 0008 | 9410 | 2002 |
| 1576360 | 1b00 | 03cf | 9a13 | 6368 | d423 | 60e8 | d623 | 60ec | 1080 | 0002 | 9410 | 2003 | 1b00 | 03cf | 9a13 | 6368 | d023 | 6050 | d223 | 6054 | c11b | 6050 | 1720 | 0000 |
| 1576440 | 982a | 000b | 170f | d899 | 80a3 | 000b | 170f | fa48 | 1480 | 0004 | 9612 | e1fb | 1080 | 01d2 | c51b | 6030 | 80a3 | 000b | 0680 | 00a5 | 9010 | 2000 | 1480 | 0006 |
| 1576520 | 1715 | 119b | 9612 | e118 | 80a2 | 400b | 0880 | 009f | 0100 | 0000 | d003 | 6050 | 191f | fc00 | 960a | 000c | 80a2 | c00c | 1280 | 0009 | 1920 | 0000 | 81a0 | 08c0 |
| 1576600 | 85a0 | 0020 | 80a2 | a003 | 0280 | 01c7 | 87a0 | 0021 | 81c3 | e008 | 0100 | 0000 | 960a | 000c | d623 | 60d8 | 901a | 000b | d603 | 6020 | 80a2 | 000b | 0680 | 0009 |
| 1576660 | c51b | 6020 | 1480 | 002b | 1715 | 110b | 9612 | e118 | d203 | 6054 | 80a2 | 400b | 1880 | 0026 | 0100 | 0000 | 81a0 | 0120 | 89a0 | 08c2 | 1700 | 03d0 | 9612 | e180 |
| 1576740 | d802 | c000 | d003 | 60d8 | 980b | 2003 | 80a3 | 2002 | 992b | 2006 | 1280 | 0009 | 8090 | 0008 | 9010 | 2001 | 83a0 | 0025 | 0280 | 0075 | 81a0 | 0024 | 9010 | 3fff |
| 1577020 | 1080 | 0072 | 81a0 | 00a4 | 0280 | 000a | 9803 | 2008 | 9010 | 3fff | 1700 | 03cf | 9612 | e128 | cd1a | c00c | 61a1 | 88c4 | 85a1 | 0840 | 1080 | 0068 | 85a1 | 88c2 |
| 1577100 | 9010 | 2001 | 1700 | 03cf | 9612 | e128 | cd1a | c00c | 81a1 | 08c6 | 85a1 | 09c0 | 1080 | 0060 | 85a0 | 88c6 | 1730 | 03d0 | 9612 | e180 | d802 | c000 | 980b | 2003 |
| 1577160 | 992b | 2006 | d423 | 60e0 | d603 | 6010 | 80a2 | 000b | 1480 | 001d | c91b | 6040 | 81a0 | 0120 | 89a0 | 0944 | c51b | 6070 | 89a0 | 8944 | 89a0 | 1a44 | 1300 | 03cf |
| 1577240 | 9212 | 60f0 | 1700 | 03cf | 9612 | e128 | 9603 | 000b | c923 | 60e4 | d003 | 60e4 | 912a | 2003 | c51a | 4008 | 85a0 | 08c2 | c91a | c008 | 81a0 | 88c4 | 85a0 | 88c0 |
| 1577320 | 85a0 | 88c4 | d603 | 60d8 | 8090 | 000b | 0280 | 003f | 9132 | 2003 | 81a0 | 00a0 | 85a0 | 00a2 | 1080 | 003b | 9020 | 0008 | 1710 | 5000 | 80a2 | 000b | 1480 | 0029 |
| 1577400 | 80a3 | 2040 | 0680 | 0027 | d603 | 60d8 | 8090 | 000b | 0280 | 0004 | c51b | 6028 | 1080 | 0003 | 85a0 | 08c2 | 85a0 | 0842 | c91b | 6040 | 89a0 | 8944 | 8da0 | 1a44 |
| 1577460 | 1700 | 03d0 | 9612 | e088 | 80a3 | 2040 | 1480 | 000e | 0100 | 0000 | 91a0 | 1906 | d51a | e000 | 95a2 | 094a | 95a0 | 08ca | d91a | e008 | 99a2 | 094c | 81a2 | 88cc |
| 1577540 | cd23 | 60e4 | d003 | 60e4 | 95a2 | 88c0 | 1080 | 001b | 85a2 | 88cc | 91a0 | 1906 | d51a | e010 | 95a2 | 094a | 95a0 | 08ca | d91a | e018 | 99a2 | 094c | c51b | 6038 |
| 1577620 | 81a2 | 88cc | cd23 | 60e4 | 1080 | 0010 | d003 | 60e4 | de23 | 60dc | d003 | 6050 | d203 | 6054 | 9403 | 6058 | 9603 | 6060 | 4000 | 019b | 0100 | 0000 | 1b00 | 03cf |
| 1577700 | 9a13 | 6368 | de03 | 60dc | c11b | 6058 | c51b | 6060 | d403 | 60e0 | 9012 | 2020 | 89a0 | 0940 | 80a2 | a002 | 1680 | 007c | 0100 | 0000 | 9402 | 000a | 808a | a001 |
| 1577760 | 1280 | 0028 | 0100 | 0000 | 1300 | 03cf | 9212 | 62a8 | 9610 | 2020 | 99a0 | 0944 | 1900 | 03d0 | 9813 | 2180 | d803 | 0000 | 992b | 2006 | 9203 | 0009 | cd1a | 6028 |
| 1600040 | 8da1 | 0946 | d11a | 400b | 8da2 | 0846 | 96a2 | e008 | 16bf | fffc | 8090 | 0008 | 0280 | 000d | 80a3 | 2080 | 0280 | 000b | 0100 | 0000 | 95a0 | 8944 | dd1b | 6070 |
| 1600120 | 95a3 | 894a | 95a0 | 88ca | 8da3 | 0946 | 95a1 | 88ca | 81a0 | 08ca | 1080 | 0004 | 0100 | 0000 | 8da3 | 0946 | 81a0 | 08c6 | 808a | a002 | 0280 | 0004 | 0100 | 0000 |
| 1600200 | 81c3 | e008 | 81a0 | 00a0 | 81c3 | e008 | 0100 | 0000 | 1300 | 03cf | 9212 | 61e8 | 9610 | 2020 | 99a1 | 0944 | 1900 | 03d0 | 9813 | 2180 | d803 | 0000 | 992b | 2006 |
| 1600260 | 9203 | 0009 | cd1a | 6028 | 8da1 | 0946 | d11a | 400b | 8da2 | 0846 | 96a2 | e008 | 16bf | fffc | 0100 | 0000 | c93b | 6048 | 8da1 | 894c | d203 | 6048 | d803 | 6000 |
| 1600340 | 80a2 | 400c | 0680 | 0009 | 9610 | 2010 | 1480 | 0006 | d203 | 604c | d803 | 6004 | 80a2 | 400c | 0a80 | 0003 | 0100 | 0000 | 9610 | 2000 | d51b | 6070 | 8090 | 000b |
| 1600420 | 0280 | 000d | 95a1 | 094a | d803 | 6008 | d203 | 6048 | 80a2 | 400c | 0680 | 0008 | d803 | 600c | 1480 | 0005 | d203 | 604c | 80a2 | 400c | 0a80 | 0003 | 0100 | 0000 |
| 1600500 | 9610 | 2008 | 8090 | 0008 | 0280 | 000a | 0100 | 0000 | 1900 | 03d0 | 9813 | 2180 | d803 | 0000 | 80a3 | 2002 | 0280 | 0004 | 0100 | 0000 | 91a0 | 0942 | 8da1 | 88c8 |
| 1600560 | 1300 | 03ba | 9212 | 6210 | 81c2 | 400b | 0100 | 0000 | 1080 | 000e | 0100 | 0000 | 1080 | 0006 | 0100 | 0000 | 8da2 | 88c6 | c11b | 6068 | 10bf | ffb7 | 81a0 | 08c6 |
| 1600640 | d11b | 6090 | 85a2 | 88c8 | 8da0 | 88c6 | c11b | 6088 | 10bf | ffb1 | 81a0 | 08c6 | d11b | 6080 | 85a2 | 88c8 | 8da0 | 88c6 | c11b | 6078 | 10bf | ffab | 81a0 | 08c6 |
| 1600720 | 1300 | 03cf | 9212 | 62a8 | 99a1 | 0944 | 1900 | 03d0 | 9813 | 2180 | d803 | 0000 | 992b | 2006 | 9203 | 0009 | 9610 | 2020 | cd1a | 6028 | 8da1 | 0946 | d11a | 400b |
| 1601000 | 8da2 | 0846 | 96a2 | e008 | 16bf | fffc | 0100 | 0000 | 1300 | 03cf | 9212 | 61e8 | 9203 | 0009 | 9610 | 2020 | d11a | 6028 | 91a1 | 0948 | d51a | 400b | 91a2 | 8848 |

```
1601060 96a2 e008 16bf fffc 0100 0000 c93b 6048 91a2 094c d203 6048 d803 6000 80a2 400c 0680 0009 9610 2010 1480 0006 d203 604c
1601140 d803 6004 80a2 400c 0a80 0003 0100 0000 9610 2000 d41b 6070 8090 000b 0280 000d 9da1 094e d803 6008 d203 6048 80a2 400c
1601220 0680 0008 d803 600c 1480 0005 d203 604c 80a2 400c 0a80 0003 0100 0000 9610 2008 60a2 a003 1280 0006 8090 0008 0280 0004
1601300 0100 0000 99a0 0942 91a2 08cc 1300 03ba 9212 636c 81c2 400b 0100 0000 1080 000e 0100 0300 1080 0006 0100 0000 95a3 88c8
1601360 e11b 606d 1080 000d 95a4 08ca e11b 6090 a1a3 88d0 95a4 08c8 e51b 6088 1080 0007 95a4 88ca e11b 6080 a1a3 88d0 95a4 08c8
1601440 e51b 6078 95a4 88ca 1900 03d0 9913 2130 d803 0000 80a2 a003 1280 0027 0100 0000 99a0 0944 8090 0008 1280 0004 8da3 0946
1601520 1080 0005 0100 0000 a1a0 894e a1a0 88d0 8da1 88d0 89a0 08c6 908a 2003 0280 0015 80a2 2002 0280 000e 0100 0000 1480 0007
1601600 0100 0000 81a0 002a 83a0 002b 85a0 00a4 1080 0045 87a0 0025 81a0 00aa 83a0 002b 85a0 0024 1080 0040 87a0 0025 83a0 0025
1601660 81a0 00a4 87a0 002b 1080 003b 85a0 00aa 81a0 0024 83a0 0025 85a0 002a 1080 0036 87a0 002b 8da1 0946 808a 2001 1280 0013
1601740 8090 0008 91a1 8848 91a3 88c8 95a2 09ca 95a0 002a 0280 000a 80a3 2002 0280 0008 0100 0000 99a0 0942 95a2 884c 95a0 094a
1602020 85a0 884a 81c3 e008 81a0 0842 95a0 094a 81c3 e008 81a0 084a 0280 000f 80a3 2002 0280 000d 0100 0000 a1a0 8944 a1a0 8850
1602100 a1a2 8950 8da0 0946 a1a1 88d0 a1a0 08d0 95a0 00aa 81a2 89d0 81a0 0020 81c3 e008 0100 0000 8da0 0946 95a0 00aa 8da0 08c6
1602160 01a2 89c6 81a0 0929 81c3 e008 0100 0000 85a0 0942 d603 6018 80a3 000b 1680 0013 d603 60a8 80a2 a003 1280 000a 0100 0000
1602240 c51b 6068 d003 60e8 c122 0000 c322 2004 d003 60ec c522 0000 1080 0006 c722 2004 80a2 a001 1280 0003 0100 0000 c11b 6068
1602320 81c3 e008 0100 0000 80a3 000b 1680 0021 80a2 a001 85a0 0940 0280 0019 0100 0000 1480 0007 0100 0000 c91b 60b0 85a0 8944
1602400 85a0 0942 81c3 e008 81a0 08c2 80a2 a002 0280 000a c91b 60b0 89a0 8944 89a0 0944 81a0 08c4 c91b 6070 85a1 0942 cd1b 6068
1602460 10bf ffdd 85a1 38c2 c91b 60b8 85a0 8944 85a0 0942 81c3 e008 81a0 0842 c91b 6070 85a1 0942 c11b 6068 81c3 e008 81a0 08c2
1602540 85a0 0940 0280 0026 0100 0000 1480 000a 0100 0000 c91b 60d0 89a0 8944 cd1b 60b0 89a1 88c4 91a0 0942 89a1 0948 81c3 e008
1602620 81a0 08c4 80a2 a003 1280 0011 0100 0000 c91b 60d0 89a0 8944 cd1b 60b0 89a1 88c4 91a0 0942 89a1 0948 81a0 08c4 c91b 60c0
1602700 89a0 8944 cd1b 6070 89a1 88c4 99a0 8944 d11b 6068 10bf ffb4 85a2 08c4 c91b 60c8 89a0 8944 cd1b 60b8 89a1 8844 91a0 0942
1602760 99a1 0948 81c3 e008 81a0 0844 c91b 60c0 89a0 8944 cd1b 6070 89a1 88c4 89a0 8944 c11b 6068 81c3 e008 81a0 08c4 0000 0000
1603040 9de3 bf78 9136 201f 8090 0008 f227 a048 0280 001b f027 a044 c507 a044 c707 a048 1100 03d0 c11a 2130 81a8 8ac0 0100 0000
1603120 3980 0009 cd07 a044 9610 001b 9410 001a 9210 0019 4000 00af 9010 0018 1080 00ab ba10 0008 cf07 a048 1300 03d0 c91a 6138
1603200 91a1 8944 1500 03d0 d51a a140 99a2 08ca 9ba0 1a4c 1080 001a db23 a060 e107 a044 e307 a048 1700 03d0 dd1a e148 81ac 0ace
1603260 0100 0000 3d80 0009 e907 a044 9610 001b 9410 001a 9210 0019 4000 0096 9010 0018 1080 0092 ba10 0008 eb07 a048 1900 03d0
1603340 e51b 2138 ada5 0952 1b00 03d0 f11b 6140 b5a5 8858 b7a0 1a5a f723 a060 f903 a060 bda0 191c fa03 a060 2100 03d0 1f00 03d0
1603420 b803 e0c8 fd3f bff8 e004 2180 80a4 2001 3280 0005 80a4 2002 2300 03d0 b804 6108 80a4 2002 3280 0005 c11f bff8 2700 03d0
1603500 b804 e120 c11f bff8 c507 0000 c707 2004 89a0 0942 cd07 a044 cf07 a048 d51f bff8 80a4 2002 91a1 88c4 d13f bff0 db07 200c
1603560 d907 2008 9da2 894c e11f bff0 dd3f bfe8 e51f bfe8 a9a4 08d2 1280 000b e93f bfe0 ec07 bfe4 ea07 bfe0 ea26 8000 ec26 a004
1603640 2d00 03d0 ed1d a150 ed26 c000 1080 005b ef26 e004 f11f bff0 f51f bfe0 b9a6 08da fd1f bfe8 c51f bff8 c907 2010 cb07 2014
1603720 81a7 08de 9da0 8944 d51f bfe0 91a1 88c0 d13f bfe8 d91f bfe8 9da2 88cc dd3f bff0 ee07 bff0 f007 bff4 ee26 8000 f026 a004
1604000 e51f bff0 e11f bfe0 a9a4 08d2 3100 03d0 ed1f bfe8 b1a5 08d6 f126 c000 f326 e004 f006 2180 80a6 2001 0280 003c 0100 0000
1604060 d207 bff4 4000 03f6 d007 bff0 80a2 3ff8 1480 0036 0100 0000 f51f bff8 f907 2018 fb07 201c bda6 895c c106 c000 c306 e004
1604140 c91f bff0 85a7 88c0 c53f bfe8 cd1f bfe8 91a1 08c6 d13f bfe0 d007 bfe0 d207 bfe4 d026 8000 d226 a004 d91f bfe0 d51f bff0
1604220 9da2 88cc e11f bfe8 a5a3 88d0 e526 c000 e726 e004 d007 bfe0 4000 03d9 d207 bfe4 80a2 3fda 1480 0019 0100 0000 e91f bff8
1604300 ed07 2020 ef07 2024 b1a5 0956 f506 c000 f706 e004 fd1f bfe0 b9a6 08da f93f bfe8 c11f bfe8 85a7 88c0 c53f bff0 d207 bff0
1604360 d407 bff4 d226 8000 d426 a004 c41f bff0 c91f bfe0 91a1 08c6 d51f bfe8 99a2 08ca d926 c000 db26 e004 81c7 e008 91e8 001d
1604440 9de3 be80 f027 a044 d007 a044 f227 a048 fd23 a060 ff23 a064 131f fc00 900a 0009 80a2 0009 b007 bff8 1280 0003 9010 2001
1604520 9010 2000 8090 0008 3280 0012 d007 a044 c107 a044 c307 a048 c507 a044 c707 a048 89a0 08c2 ba10 2000 c93f bff0 d207 bff0
1604600 d407 bff4 d226 c000 d426 e004 d407 bff0 d607 bff4 d426 8000 1080 034e d626 a004 d207 a048 d023 a044 c103 a044 81a0 0120
1604660 bda0 0020 d223 a048 c303 a048 bfa0 0021 ee07 a044 fd3b a068 d003 a068 d203 a06c fd23 a060 ff23 a064 4000 038d af35 e01f
1604740 ff03 a064 fd03 a060 9022 201f 4000 0b67 9210 2018 ba10 0008 8090 001d 3480 0004 fd3b a068 1080 0003 ba10 2000 d003 a068
1605020 d203 a06c fd23 a060 ff23 a064 9420 001d 952a a003 972a a001 4000 03dd 9402 800b bfa0 0021 bda0 0020 fd3f bff8 1100 03d1
1605100 d902 20e4 2d38 0000 992b 2002 9806 000c e003 0000 1500 03d1 a00c 3fe0 e023 0000 cd1f bff8 cd3f bfe8 d002 20e4 1700 03d0
1605160 912a 2002 9006 0008 ea02 0000 1300 03d0 aa0d 4016 ea22 0000 d51f bfe8 e11f bfe8 a5a7 88d0 d91f bff8 d11f bff8 d13f bfe0
1605240 b802 6394 9da2 88cc e53f bfe8 dd3f bfd8 e91a a0c8 e93f bfd0 d602 e180 80a2 e001 3280 0008 80a2 e002 1b00 03d1 ed1b 60d0
1605320 e13f bfd0 1900 03d0 b803 229c 80a2 e002 3280 0008 80a7 6001 2300 03d1 f11c 60d8 f13f bfd0 2100 03d0 b804 2184 80a7 6001
1605400 2680 0012 2900 03d1 a427 6001 a52c a002 f307 0012 b5a0 1919 80a7 6001 0480 000a f53f bfc8 a827 6002 a92d 2002 f707 0014
1605460 b9a0 191b 2d00 03d1 c11d a0a8 85a7 094c c53f bfc0 2900 03d1 c91d 20b0 c93f bfb8 d11f bfb8 dd1f bfb8 d91d 20b0 9da3 894c
1605540 932f 6002 cb07 0009 8da0 1905 9607 6001 972a e002 9e07 6002 9f2b e002 a407 6003 a52c a002 95a1 8948 dd3f bfb8 df07 000b
1605620 a1a0 190f e51f bfb8 f11f bfb8 a9a4 0952 bfa0 002b bda0 002a aa07 6004 ab2d 6002 1100 03d1 e93f bf70 ed1d 20b0 b1a6 0956
1605700 f13f bfb8 f307 c00f b5a0 1919 f91f bfb8 c91f bfb8 81a6 895c f11f bfe8 c13f bf78 c51d 20b0 89a1 0942 c93f bfb8 cb07 0012
1605760 8da0 1905 d11f bfb8 dd1f bfb8 95a1 8948 d53f bf80 d91d 20b0 9da3 894c dd3f bfb8 df07 0015 a1a0 190f e51f bfb8 a9a4 0952
1606040 e93f bf88 ed1a 20e8 81ae 0a56 0100 0000 2380 0049 80a7 6001 f91f bfd8 1300 03d1 f51a 60e8 81af 0a5a 0100 0000 2380 0016
1606120 8090 001d c11f bff8 85a0 095e c91f bff8 cd1f bf70 d51f bff8 d91f bf78 e11f bff8 91a1 0946 e51f bf80 ed1f bff8 f11f bf88
```

```
1606200  c53f bf18 9da2 894c d13f bf20 a9a4 0952 dd3f bf28 b5a5 8958 e93f bf30 1080 007d f53f bf38 2480 000a d51f bff8 f91f bfd8
1606260  c11f bfc8 85a7 0940 c91f bff8 81a1 095e 91a1 8842 1080 0004 d13f bf18 99a2 895e d93f bf18 dd1f bfd8 a1a3 895e e51f bff8
1606340  e91f bf70 f51f bfd8 f91f bf70 c51f bff8 ada4 8954 c91f bf78 d51f bfd8 d91f bf78 b1a5 8850 81a6 895c e51f bf80 f13f bf20
1606420  e11f bff8 f11f bfd8 8da0 0944 f51f bf80 91a1 8840 9da2 894c c51f bf88 c11f bff8 d13f bf28 a9a4 0952 b9a6 095a ada5 084e
1606500  89a0 0942 ed3f bf30 8da1 085c 1080 0051 cd3f bf38 2680 0023 c91f bfd8 80a7 6001 2480 000e f91f bfd8 d11f bfd8 d51f bfc8
1606560  99a2 094a dd1f bff8 e91f bfe8 e11f bfc0 a1a3 895e b1a5 0956 a5a4 084c b5a4 8858 1080 0008 f53f bf18 c11f bfc8 85a7 0940
1606640  c91f bff8 8da1 095e 91a1 8842 d13f bf18 d51f bfd8 99a2 895e dd1f bff8 e11f bf70 ed1f bfe8 f11f bfc8 a5a3 8950 b5a5 8958
1606720  a9a4 884c b9a5 085a 1080 000b f93f bf20 9da1 095e d11f bff8 d51f bf70 c11f bff8 99a2 094a 85a0 095e 9da3 0846 c53f bf18
1607000  dd3f bf20 e11f bfd8 e51f bf70 a9a4 0952 ed1f bff8 f11f bf78 c11f bfe8 cd1f bfd8 d11f bf78 b5a5 8958 d91f bff8 dd1f bf80
1607060  b9a6 8854 85a0 095e ed1f bf70 95a1 8948 89a7 0942 e91f bfe8 c11f bf80 a1a3 094e cd1f bf88 c93f bf28 f91f bfd8 c91f bff8
1607140  a5a4 084a b1a5 0956 dd1f bf78 d91f bfe8 85a7 0940 b5a4 8858 91a1 0946 f53f bf30 a1a3 094e 95a2 0842 a5a2 8850 e53f bf38
1607220  ed1f bf18 2100 03d1 e91c 20f0 b1a5 8954 f123 a068 d003 a068 f323 a068 d203 a068 fd23 a060 ff23 a064 4000 09a1 0100 0000
1607300  c91f bf20 1700 03d1 f51a e0f8 b9a6 8940 c11f bf18 81a0 08dc c13f bf18 c51c 20f0 8da1 0942 bfa0 1a46 cf23 a068 f203 a068
1607360  8090 0019 2280 001b f51f bf38 b32e 6003 f223 a068 d103 a068 95a0 1908 d91f bf20 e11f bf28 99a3 08ca 1f00 03d1 d93f bf20
1607440  dd1b e0f0 a5a4 094e a7a0 1a52 e723 a068 f203 a068 8090 0019 2280 000a f51f bf38 b32e 6003 f223 a068 e903 a068 ada0 1914
1607520  f11f bf28 b1a6 08d6 f13f bf29 f51f bf30 f91f bf39 61a6 985c c51f bf28 cd1f bf20 d51f bf18 dd1f bf18 e51f bf20 bfa0 0021
1607600  bda0 0020 89a7 8842 ed1f bf28 f51f bf30 c11f bf38 2300 03d1 bfa0 0025 bda0 0024 91a7 8846 bfa0 0029 bda0 0028 99a7 884a
1607660  bfa0 002d bda0 002c a1a3 88de e13f bf08 e91f bf08 a9a5 0852 e93f bf08 f11f bf08 b1a6 0856 f13f bf08 f91f bf08 b9a7 085a
1607740  f93f bf08 c51f bf08 85a0 8840 c53f bf08 87a0 1a5e c723 a068 f203 a068 f223 a068 c903 a068 8da0 1904 d91f bf08 e91f bf08
1610020  91a7 88c6 d13f bf10 d51f bf10 9da2 884c e11f bf10 bfa0 002f bda0 002e a5a4 08de a9a5 0852 e93f bf08 ed1c 6100 81af 8ad6
1610100  01c0 0000 2d80 0010 cd1f bf08 2500 03d1 f11c a100 81af 8a58 0100 0000 2380 0019 d207 bf34 f91f bf08 2700 03d1 f51c e0e8
1610160  81af 0ada 0100 c000 3480 0012 d2c7 bf34 cd1f bf08 dd1f bf08 2900 03d1 c11d 2108 85a7 88c0 b206 6001 c53f bf10 c91f bf10
1610240  91a1 0846 d51f bf10 bfa0 0029 bda0 0028 99a2 88de 9da3 884c dd3f bf08 d207 bf34 d007 bf30 fd23 a060 ff23 a064 4000 01d0
1610320  0100 0000 ff03 a064 fd03 a060 fd3b a068 d203 a06c ac10 0008 d003 a068 fd23 a060 4000 01c7 0100 0000 ff03 a064 fd03 a060
1610400  9022 0016 80a2 2014 3680 0117 c51f bf08 f223 a068 df03 a068 a1a0 190f e51f bf18 ed1f bf20 a9a4 88d0 c51f bf20 cd1f bf28
1610460  2dc0 03d1 9007 6305 912a 2002 1500 03d1 e93f bf10 f11f bf10 b5a5 8858 f91f bf10 bfa0 003b bda0 003a 81a7 88dc fd3f bf10
1610540  dd1f bf10 ed1f bf30 89a0 08c2 91a1 88c4 d13f bf08 d51f bf08 99a2 885e e51f bf08 d11f bf38 bfa0 002d bda0 002c a1a7 88ce
1610620  fd3f bf10 c11f bf10 a9a4 08d2 dd1f bfb8 b1a5 88d4 f13f bf08 f51f bf08 b9a6 885e c91f bf09 f11f bfe8 bfa0 003d bda0 003c
1610700  85a7 88c0 8da0 88c4 95a2 08c6 d53f bf08 d91d a0b0 9da3 894c dd3f bfb8 df07 0008 a1a0 190f e51f bfb8 a9a4 0952 e93f bf90
1610760  ed1a a0e8 81ae 0a56 0100 0000 2380 0016 e91f bfd8 f91f bfd8 1700 03d1 f51a e0e8 81af 0a5a 0100 0000 2380 0007 cd1f bfd8
1611040  c11f bfe0 c51f bf90 89a0 0942 1080 0015 c93f bf40 d11f bf88 95a1 8948 d91f bfe0 dd1f bf90 a1a3 094e a5a4 084a 1080 000d
1611120  e53f bf40 cd1f bf88 b1a5 0956 f51f bfe0 f91f bf90 c91f bfe8 cd1f bf80 81a6 895c 91a1 0946 85a0 0858 95a0 8848 d53f bf40
1611200  d207 bf3c d007 bf38 fd23 a060 ff23 a064 4000 015f 0130 0000 ff03 a064 fd03 a060 fd3b a068 d203 a06c ac10 0008 d003 a068
1611260  fd23 a060 4000 0156 0100 0000 ff03 a064 fd03 a060 9022 0016 80a2 2014 2680 0007 fd3f bf10 d91f bf40 dd1f bf08 9da3 884c
1611340  1080 0096 dd3f bf08 e11f bf08 bda7 8850 e51f bf10 ed1f bf40 c51f bfb8 a9a7 88d2 d91f bfe8 1b00 03d1 9e07 6006
1611420  9f2b e002 2300 03d1 b1a5 08d6 b9a6 88d8 f93f bf08 c11b 60b0 85a0 8940 c53f bfb8 c707 000f 89a0 1903 cd1f bfb8 91a1 0946
1611500  d13f bf98 d51c 60e8 81ab 0a4a 0100 0000 2380 0016 d11f bfd8 e11f bfd8 2500 03d1 dd1c a0e8 81ac 0a4e 0100 0000 2380 0007
1611560  f11f bfd8 e51f bfe0 e91f bf98 ada4 8954 1080 0015 ed3f bf48 f51f bf90 b9a6 095a c11f bfe0 c51f bf98 89a0 0942 8da1 085c
1611640  1080 c00d cd3f bf48 d51f bf90 99a2 094a dd1f bfe0 e11f bf98 ed1f bfe8 f11f bf88 a5a3 8950 b5a5 8958 a9a4 884c b9a5 085a
1611720  f93f bf48 d207 bf44 d007 bf40 fd23 a060 ff23 a064 4000 010a 0100 0000 ff03 a064 fd03 a060 fd3b a068 d203 a06c ac10 0008
1612000  d003 a068 fd23 a060 4000 0101 0100 0000 ff03 a064 fd03 a060 9022 0016 80a2 2014 2680 0007 fd3f bf10 c11f bf48 c51f bf08
1612060  85a0 8840 1080 0041 c53f bf08 c91f bf08 bda7 8844 cd1f bf10 d51f bf08 dd1f bf48 e91f bfb8 91a7 88c6 c11f bfe8 2900 03d1
1612140  ba07 6007 bb2f 6302 1100 03d1 99a2 08ca a1a3 88cc e13f bf08 e51d 20b0 a9a5 0952 e93f bfb8 eb07 001d ada0 1915 f11f bfb8
1612220  b5a5 8958 f53f bfa0 f91a 20e8 81a8 0a5c 0100 0000 2380 0016 f51f bfd8 c91f bfd8 1300 03d1 c51a 60e8 81a9 0a42 0100 0000
1612300  2380 0007 d91f bfd8 cd1f bfe0 d11f bfa0 95a1 8948 1080 0015 d53f bf50 dd1f bf98 a1a3 094e e51f bfe0 e91f bfa0 ada4 8954
1612360  b1a5 8850 1080 000d f13f bf50 f91f bf98 81a6 895c c51f bfe0 c91f bfa0 d51f bfe8 d91f bf90 8da0 8944 9da2 894c 91a1 8840
1612440  a1a2 084e e13f bf50 e51f bf50 e91f bf08 a9a5 0852 e93f bf08 fd3f bf10 ed1f bf08 b1a5 885e f51f bf10 c11f bf08 bfa0 0039
1612520  bda0 0038 b9a7 89da 81a0 08dc c13f bf08 c51f bf08 fd3f bff8 fd3f bfb8 c53f bf10 1100 03d1 d402 20e4 2938 0000 952a a002
1612600  94c6 00ca da02 8000 1300 03d1 9a0b 7fe0 da22 8000 fd1f bff8 d002 20e4 1700 03d1 912a 2002 b006 0008 e606 0000 80a5 e001
1612660  a60c c014 e626 0000 c91f bff8 8da7 88c4 d11f bfb8 e51f bff8 e11f bfd0 a9a4 0952 d91f bf10 95a7 88c8 cd3f bf08 f11f bf08
1612740  ed1a 60c0 b5a5 8958 9da3 08ca d11f bff8 b9a6 8854 bfa0 002f bda0 002e dd1f bf08 ed1f bff8 f93f bef8 c11a e0b8 85a0 095e
1613020  c91f bef8 89a1 0842 c93f bef8 cd1a 60c0 95a1 8948 d91a e0b8 a1a3 094e d11f bef8 a5a4 084a e53f bef0 e91a e0b8 b1a5 0956
1613100  f51f bef0 c91f bef0 bfa0 0039 bda0 0038 b9a7 885a f93f bf00 c11f bf00 85a0 08de d91f bf00 8da0 88c4 95a2 08c6 bfa0 002b
1613160  bda0 002a 9da3 095e dd26 8000 df26 a004 e51f bf00 e306 a004 e106 8000 a9a4 08d2 ada7 88d4 ed26 c000 1280 000d ef26 e004
1613240  f106 8000 f306 a004 b1a0 00b8 f126 8000 f326 a004 f506 c000 f706 e004 b5a0 00ba f526 c000 f726 e004 b220 0019 ba0e 6007
```

```
1613320 81c7 e008 91e8 001d 1900 03d1 9813 2138 d223 2004 1720 0000 902a 000b 920a 800b 9012 0009 d023 0000 c11b 00c0 81c3 e008
1613400 0100 0000 131f fc00 900a 4008 90a2 0009 1280 0004 9000 2001 81c3 e008 9010 0000 81c3 e008 0100 0000 171f fc00 940a c008
161346c 94a2 c00a 1280 0008 173f fc00 902a 000b 9092 0009 0280 0004 0100 0000 81c3 e008 9010 2001 81c3 e008 9010 0000 171f fc00
1613540 940a c008 94a2 c00a 1280 0008 173f fc00 902a 000b 9092 0009 1280 0004 0100 0000 81c3 e008 9010 2001 81c3 e008 9010 0000
1613620 171f fc0c 948a c008 0280 0006 94a2 c00a 0280 0004 0100 0000 81c3 e008 9010 2001 81c3 e008 9010 0000 171f fc00 948a c008
1613700 1280 0008 1720 0000 942a 000b 9092 8009 0280 0004 0100 0000 81c3 e008 9010 2001 81c3 e008 9010 0000 1720 0000 942a 000b
1613760 9092 400a 1280 0004 0100 0000 81c3 e008 9010 2001 81c3 e008 9010 0000 1bc0 03d1 9a13 6138 d223 6004 d023 4000 191f fc00
1614040 948b 0008 1280 0005 c11b 4000 c51b 6010 1080 000c 0100 0000 80a3 000a 1280 0006 973a a014 111f ffff 9012 23ff 81c3 e008
1614120 0100 0000 9422 e3ff 81c3 e008 9010 000a 81a0 0942 c123 4000 d403 4000 948b 000a 0280 0004 953a a014 10bf fff8 9422 a435
1614200 1120 0000 9012 2001 81c3 e008 0100 0000 1b00 03d1 9a13 6138 d023 4000 d223 6004 d423 6008 d623 600c c11b 4000 c51b 6008
1614260 1920 0000 81a8 0a42 962a 000c 8092 400b 1380 001c 0100 0000 0f80 0018 0100 0000 1280 000b 808a 000c c51b 6028 85a0 8942
1614340 900a 800c 9210 2001 d023 4000 d223 6004 c11b 4000 81c3 e008 0100 0000 0280 0006 0100 0000 0980 000d 0100 0000 0d80 0016
1614420 0100 0000 0100 0000 0980 0013 0100 0000 0d80 0006 0100 0000 81c3 e008 81a0 0842 81c3 e008 0100 0000 191f fc00 92a2 6001
1614500 9062 0000 948a 000c d023 6008 1280 0003 d223 600c 85a0 0940 c11b 6008 81c3 e008 0100 0000 9282 6001 9042 0000 191f fc00
1614560 d023 6008 948a 000c 0280 0005 d223 600c 80a2 800c 1280 0003 0100 0000 85a0 0940 c11b 6008 81c3 e008 0100 0000 1b00 03d1
1614640 9a13 6138 d223 6004 d023 4000 191f fc00 968b 0008 1280 0004 92a3 000b 1080 0019 c51b 6010 1280 0005 9732 e014 c11b 4000
1614720 81c3 e008 81a0 0840 9682 800b 1e80 0004 932a e014 1080 0028 c11b 6020 1480 0004 80a2 e7ff 1080 001a 9682 e036 0680 0004
1615000 902a 000c 1080 0020 c11b 6020 9012 0009 d023 4000 c11b 4000 81c3 e008 0100 0000 c11b 4000 81a0 0942 c13b 4000 d003 4000
1615060 968a 000c 1280 0004 9732 e014 81c3 e008 0100 0000 9622 e036 9682 800b 1ebf ffe8 932a e014 1080 001c 0100 0000 0480 001a
1615140 932a e014 902a 000c 9012 0009 d023 4000 c11b 4000 c51b 6018 81a0 0942 81c3 e008 0100 0000 c92b 4000 d803 4000 1731 0000
1615220 808b 000b 1280 001b 1320 0000 9813 2120 d823 4000 c90b 4000 171f fc00 920a 0009 9612 400b d623 4000 c023 6004 81c3 e008
1615300 c11b 4000 c92b 4000 d803 4000 1730 8000 808b 000b c11b 6028 1280 000a 1320 0000 9813 20a0 d823 4000 c90b 4000 920a 0009
1615360 d223 4000 c023 6004 81c3 e008 c11b 4000 928a 4008 1280 0004 87a0 0021 1080 0003 85a0 0020 85a0 00a0 81a0 0942 81c3 e008
1615440 0100 0000 81c3 e008 9132 201f 0000 0000 9de3 bf58 f227 a048 c307 a048 f027 a044 c107 a044 c13f bff8 f627 a050 c707 a050
1615520 f427 a04c c507 a04c c53f bff0 b210 2000 b607 a044 b606 c019 da06 c000 111f ffff 9012 23ff 9a0b 4008 b007 a04c b006 0019
1615600 da26 c000 e406 0000 ac07 bfe0 a40c 8008 e426 0000 f806 c000 fa06 0000 111f fc00 ae10 0008 b80f 0017 ba0f 4017 80a7 401c
1615660 0480 0010 b407 bfe8 c907 a044 cb07 a048 c93f bfd8 e007 a050 de07 a04c e207 bfdc e027 a048 e007 bfd8 aa10 0014 ba10 001c
1615740 b810 0015 e027 a04c e227 a050 de27 a044 2500 f000 a227 001d 80a4 4012 2480 0008 2717 cc00 cd07 a04c cf07 a050 d107 a044
1616020 d307 a048 1080 00e8 91a2 0846 80a7 0013 3680 0078 80a7 0017 2908 f400 80a7 4014 2480 0074 80a7 0017 1700 03d2 c022 e370
1616100 db07 a050 d907 a04c d707 a048 d507 a044 9da2 88cc e707 a050 e507 a04c c92b a044 f803 a044 1930 0000 dd3f bfd8 e11f bfd8
1616160 81ac 0ad2 982f 000c d823 a044 b937 201e b80f 2003 1d80 001f c90b a044 d006 c000 d026 8019 c026 a004 ed1f bfe8 eb07 a048
1616240 e907 a044 b1a5 08d6 c51f bfe8 c307 a048 c107 a044 f507 a04c fb07 a050 89a0 0842 f13f bfd0 f907 a04c f707 a050 b5a0 00ba
1616320 bda7 095a cd1f bfd0 dd1f bfe8 d91f bfe8 91a1 8944 a1a3 094e 95a7 88c8 a5a4 08ca e523 a060 d003 a060 1080 002e e723 a060
1616400 e907 a044 eb07 a048 ed07 a044 ef07 a048 ada5 8854 ba10 2004 ef27 a048 ed27 a044 f006 0000 f025 8019 c025 801d f51f bfe0
1616460 f307 a050 f107 a04c b9a6 08da f93f bfc8 d406 c000 d426 8019 c026 801d c11f bfe8 ff07 a048 fd07 a044 85a7 88c0 e51f bfd8
1616540 d91f bfe0 cf07 a048 cd07 a044 c91f bfc8 91a1 0946 c53f bfd0 d51f bfd0 e91f bfd8 a5a0 00b2 f91f bfe0 9da2 894c f51f bfe8
1616620 ada5 0952 a1a3 8848 bda6 895c b1a5 88d0 81a7 88d8 c123 a060 d003 a060 c323 a060 4000 0096 d203 a060 c327 a048 c127 a044
1616700 8090 001c 2280 007f f606 c000 b80f 2003 1700 03d2 f822 e370 c92b a044 d003 a044 1930 0000 902a 000c b92f 201e b817 0008
1616760 f823 a044 1080 0072 c90b a044 0100 0000 2280 0006 d207 a048 80a7 4017 3280 002a 809c 001d d207 a048 d007 a044 8090 0009
1617040 1280 0007 1520 0000 902a 000a 151f fc00 90a2 000a 0280 0003 9010 2001 9010 2000 8090 0008 2280 0006 d207 a050 c507 a044
1617120 c707 a048 1080 0069 c53f bfc0 d007 a04c 8090 0009 1280 0007 1520 0000 902a 000a 151f fc00 80a2 000a 0280 0003 9010 2001
1617200 9010 2000 8090 0008 2280 0006 cd07 a044 c907 a04c cb07 a050 1080 0058 c93f bfc0 cf07 a048 d107 a04c d307 a050 1080 0052
1617260 95a1 8848 3280 0030 e606 c000 dd07 a04c df07 a050 1700 03d1 d91a e248 81ab 8a4c 0100 0000 3380 000b e907 a044 e507 a044
1617340 e707 a048 1900 03d1 e11b 2248 81ac 8a50 0100 0000 2380 0009 f907 a044 e907 a044 eb07 a048 ed07 a04c ef07 a050 b1a5 0856
1617420 1080 003a f13f bfc0 fb07 a048 c107 a04c c307 a050 1100 03d1 f51a 2238 b9a7 095a 2100 03d1 fb27 a048 f927 a044 fd1a 2238
1617500 81a0 095e d007 a044 d207 a048 c327 a050 c127 a04c d407 a04c 7fff fef6 d607 a050 c51c 2240 89a0 8940 cb27 a048 1080 0014
1617560 c927 a044 230f fc00 a227 0011 a624 c011 e626 c000 d006 0000 9022 0011 d026 0000 f826 8019 c026 a004 d007 a044 d207 a048
1617640 d407 a04c 7fff fee3 d607 a050 cd1f bfe8 91a1 8940 d127 a044 d327 a048 f606 c000 80a6 c017 3280 000b d507 a044 d607 bff4
1617720 d407 bff0 d207 bffc d007 bff8 4000 00d7 9810 2004 c327 a048 c127 a044 d507 a044 d707 a048 d53f bfc0 c11f bfc0 81c7 e008
1620000 81e8 0000 0000 0000 1b00 03d1 9a13 6290 d223 6004 d023 6000 190f fc00 98a2 000c 1280 0014 9883 2001 1700 8000 80a2 400b
1620060 1880 0016 8090 0009 1280 0004 0100 0000 81c3 e008 c11b 6000 c51b 6058 953a 6001 d423 6004 808a 6001 1280 0003 c11b 6000
1620140 85a0 00a2 91a0 0842 81c3 e008 0100 0000 1280 0006 191f fc00 173f 0000 80a2 400b 18bf fff2 0100 0000 1700 0400 940a 000c
1620220 80a2 800b 1480 0017 1720 0000 942a 000b 8092 8009 0280 0085 8090 0008 0680 0086 c51b 6008 c11b 6000 81a0 0942 de23 6054
1620300 c13b 6040 d003 6040 d203 6044 7fff ffcf 0100 0000 1b00 03d1 9a13 6280 c51b 6010 81a0 0942 de03 6054 81c3 e008 0100 0000
1620360 8090 0008 0680 0074 80a2 800c 0280 006f c92b 6048 d403 6048 173f e000 942a 800b 1710 0000 9412 800b d423 604c c90b 604c
```

```
1620440 c11b 6000 c51b 6018 85a0 0942 9132 2001 1317 fa00 9022 4008 1500 03d1 9412 a2e0 9332 200c 920a 60fc 9402 8009 d602 8000
1620520 9022 c00b d023 6038 d51b 6038 89a2 894a 8da0 8944 d11b 6028 8da2 08c6 89a2 8946 1900 0400 8da0 0944 c93b 6040 d603 6040
1620600 9622 c00c d623 6040 d11b 6040 91a2 0946 d51b 6028 91a2 88c8 89a1 8948 8da0 89c4 8da0 0026 d803 6048 9013 2021 d023 6050
1620660 9733 201e 153c 0000 982b 000a 1510 0000 9813 000a 9813 2020 981b 2020 d823 604c c93b 6040 d003 6040 1300 0400 9022 0009
1620740 d023 6040 d51b 6040 89a1 884a 89a0 0024 c90b 604c 81a0 89c4 81a0 0020 c93b 6040 d003 6040 d203 6044 1900 0400 9022 000c
1621020 d023 6040 c51b 6040 9282 6001 9042 0000 d023 6040 d223 6044 c91b 6030 9810 2020 c11b 6000 c92b 604c 89a0 0944 d003 604c
1621100 908a 000c 1280 000d 0100 0000 81a8 0a42 0100 0000 0380 0006 0100 0000 c90b 6048 81a0 0840 81c3 e008 0100 0000 81a0 0024
1621160 83a0 0025 c93b 6000 808a e001 1280 000c d803 6000 d403 6004 9482 a001 9843 0000 d823 6000 d423 6004 808a e002 0280 0004
1621240 c11b 6000 c503 6040 c703 6044 81a0 0842 81c3 e008 c90b 6050 c11b 6000 81c3 e008 81a0 0840 c11b 6000 d003 6000 d203 6004
1621320 153f fc00 960a 000a 80a2 c00a 1280 0007 902a c00a 8092 0009 0280 0004 0100 0000 81c3 e008 81a0 0840 1700 03d1 9612 e3e0
1621400 de22 c000 d003 6000 d203 6004 9410 0008 9610 0009 9810 201a 4000 0008 0100 0000 1100 03d1 9012 23e0 de02 0000 81c3 e008
1621460 0100 0000 0000 c000 9de3 bf60 f027 a044 c107 a044 f227 a048 c307 a048 c13f bfe8 f427 a04c c507 a04c f627 a050 c707 a050
1621540 c53f bff0 b827 2001 80a7 2019 1880 0340 b92f 2002 1300 03c3 9212 6018 d007 0009 81c2 0000 0100 0000 000f 0c80 000f 0cf0
1621620 000f 0d60 000f 0e58 000f 0e9c 000f 0ee0 000f 0f3c 000f 0f98 000f 1008 000f 1078 000f 10e8 000f 1158 000f 11c8 000f 1238
1621700 000f 127c 000f 12ec 000f 135c 000f 13cc 000f 143c 000f 14ac 000f 1504 000f 15e8 000f 16c0 000f 17b4 000f 1824 000f 1890
1621760 1300 03d2 9212 60e0 9010 2001 d027 bfe0 d227 bfe4 1300 03d2 c91a 60b0 c923 a060 d203 a060 cb23 a060 d403 a060 4000 0317
1622040 9010 2003 c13f bff8 4000 041c 9007 bfe0 8090 0008 3280 030f c11f bff8 1300 03d2 9212 60e5 9410 2013 4000 0608 9010 2002
1622120 9410 2021 1700 0295 1080 0305 d422 e1c8 1b00 03d2 9a13 60f9 9810 2001 d827 bfe0 da27 bfe4 1300 03d2 cd1a 60b0 cd23 a060
1622200 d203 a060 cf23 a060 d403 a060 4000 02fb 9010 2003 c13f bff8 4000 0400 9007 bfe0 8090 0008 3280 02f3 c11f bff8 1300 03d2
1622260 9212 60fe 9410 2013 4000 05ec 9010 2002 9e10 2021 2100 0295 1080 02e9 de24 21c8 d107 a04c d307 a050 d507 a044 d707 a048
1622340 d13f bfe8 d53f bff0 2500 03d2 a414 a112 a210 2001 e227 bfe0 e427 bfe4 1900 03d2 d91b 20b0 d923 a060 d003 a060 db23 a060
1622420 d203 a060 d223 a048 c303 a048 1320 0000 b00e 0009 902a 0009 9012 0018 d023 a044 dd1b 20b0 c103 a044 81a8 0a4e 0100 0000
1622500 2380 0006 1300 03d2 e107 a04c e307 a050 1080 000e e13f bfd8 9212 6058 d002 4000 d202 6004 d223 a048 c303 a048 1320 0000
1622560 b40e 8009 902a 0009 9012 001a d023 a044 c103 a044 c13f bfd8 e51f bfd8 e53f bff8 4000 03c2 9007 bfe0 8090 0008 3280 02b5
1622640 c11f bff8 1300 03d2 9212 6118 9410 2014 4000 05ae 9010 2002 2b00 0295 a810 2021 1080 02ab e825 61c8 2f00 03d2 ae15 e12d
1622720 ac10 2003 ec27 bfe0 ee27 bfe4 3100 03d2 e91e 2040 e93f bff8 4000 03ac 9007 bfe0 8090 0008 3280 029f c11f bff8 3500 0295
1623000 b210 2022 1080 029a f226 a1c8 3b00 03d2 ba17 6133 b610 2003 f627 bfe0 fa27 bfe4 1100 03d2 ed1a 2040 ed3f bff8 4000 039b
1623060 9007 bfe0 8090 0008 3280 028e c11f bff8 1500 0295 9210 2022 1080 0289 d222 a1c8 1900 03d2 9813 2138 9610 2003 d627 bfe0
1623140 dd27 bfe4 1300 03d2 f11a 60b0 f123 a060 d203 a060 f323 a060 d403 a060 4000 027f 9010 2002 c13f bff8 4000 0384 9007 bfe0
1623220 8090 0008 3280 0277 c11f bff8 1f00 0295 9a10 2022 1080 0272 da23 e1c8 2300 03d2 a214 613c a010 2004 e027 bfe0 e227 bfe4
1623300 1300 03d2 f51a 60b0 f523 a060 d203 a060 f723 a060 d403 a060 4000 0268 9010 2001 c13f bff8 4000 036d 9007 bfe0 8090 0008
1623360 3280 0260 c11f bff8 2700 0295 a410 2022 1080 025b e424 e1c8 2b00 03d2 aa15 6140 a810 2002 e827 bfe0 ea27 bfe4 1300 03d2
1623440 f91a 60b8 f923 a060 d203 a060 fb23 a060 d403 a060 4000 0251 9010 2000 c13f bff8 4000 0356 9007 bfe0 8090 0008 3280 0249
1623520 c11f bff8 1300 03d2 9212 6143 9410 200f 4000 0542 9010 2002 2f00 0295 ac10 2021 1080 023f ec25 e1c8 3300 03d2 b216 6153
1623600 b010 2001 f027 bfe0 f227 bfe4 1300 03d2 fd1a 60b0 fd23 a060 d203 a060 ff23 a060 d403 a060 4000 0235 9010 2003 c13f bff8
1623660 4000 033a 9007 bfe0 8090 0008 3280 022d c11f bff8 1300 03d2 9212 6156 9410 2011 4000 0526 9010 2002 3700 0295 b410 2021
1623740 1080 0223 f426 e1c8 1100 03d2 9012 2168 d027 bfe4 ba10 2002 fa27 bfe0 1300 03d2 c11a 60b8 c123 a060 d203 a060 c323 a060
1624020 d403 a060 4000 0219 9010 2000 c13f bff8 4000 031e 9007 bfe0 8090 0008 3280 0211 c11f bff8 1300 03d2 9212 616b 9410 200f
1624100 4000 05ca 9010 2002 9210 2021 1500 0295 1080 0207 d222 a1c8 1900 03d2 9813 217b 9610 2001 d627 bfe0 d827 bfe4 1300 03d2
1624160 c51a 60b0 c523 a060 d203 a060 c723 a060 d403 a060 4000 01fd 9010 2003 c13f bff8 4000 0302 9007 bfe0 8090 0008 3280 01f5
1624240 c11f bff8 1300 03d2 9212 617e 9410 2011 4000 04ee 9010 2002 9a10 2021 1f00 0295 1080 01eb da23 e1c8 2300 03d2 a214 6190
1624320 a010 2002 e027 bfe0 e227 bfe4 1300 03d2 c91a 60b8 c923 a060 d203 a060 cb23 a060 d403 a060 4000 01e1 9010 2000 c13f bff8
1624400 4000 02e6 9007 bfe0 8090 0008 3280 01d9 c11f bff8 1300 03d2 9212 6193 9410 200f 4000 04d2 9010 2002 2700 0295 a410 2021
1624460 1080 01cf e424 e1c8 2b00 03d2 aa15 61a3 a810 2001 e827 bfe0 ea27 bfe4 1300 03d2 cd1a 60b0 cd23 a060 d203 a060 cf23 a060
1624540 d403 a060 4000 01c5 9010 2003 c13f bff8 4000 02ca 9007 bfe0 8090 0008 3280 01bd c11f bff8 1300 03d2 9212 61a6 9410 2011
1624620 4000 04b6 9010 2002 2f00 0295 ac10 2021 1080 01b3 ec25 e1c8 3300 03d2 b216 61b8 b010 2003 f027 bfe0 f227 bfe4 3500 03d2
1624700 d11e a040 d13f bff8 4000 02b4 9007 bfe0 8090 0008 3280 01a7 c11f bff8 3b00 0295 b610 2022 1080 01a2 f627 61c8 1300 03d2
1624760 9212 61be 9010 2002 d027 bfe0 d227 bfe4 1300 03d2 d51a 60b0 d523 a060 d203 a060 d723 a060 d403 a060 4000 0198 9010 2000
1625040 c13f bff8 4000 029d 9007 bfe0 8090 0008 3280 0190 c11f bff8 1300 03d2 9212 61c4 9410 2012 4000 0489 9010 2002 9410 2021
1625120 1700 0295 1080 0186 d422 e1c8 1b00 03d2 9a13 61d7 9810 2002 d827 bfe0 da27 bfe4 1300 03d2 d91a 60b8 d923 a060 d203 a060
1625200 db23 a060 d403 a060 4000 017c 9010 2000 c13f bff8 4000 0281 9007 bfe0 8090 0008 3280 0174 c11f bff8 1300 03d2 9212 61db
1625260 9410 2010 4000 046d 9010 2002 9e10 2021 2100 0295 1080 016a de24 21c8 2500 03d2 a414 a1ec a210 2001 e227 bfe0 e427 bfe4
1625340 1300 03d2 dd1a 60b0 dd23 a060 d203 a060 df23 a060 d403 a060 4000 0160 9010 2003 c13f bff8 4000 0265 9007 bfe0 8090 0008
1625420 3280 0158 c11f bff8 1300 03d2 9212 61f0 9410 2012 4000 0451 9010 2002 2900 0295 a610 2021 1080 014e e625 21c8 2d00 03d2
1625500 ac15 a203 aa10 2002 ea27 bfe0 ec27 bfe4 1300 03d2 e11a 60b8 e123 a060 d203 a060 e323 a060 d403 a060 4000 0144 9010 2000
```

| | | | | | | | | | | | | | | | | | | | | | | | | |
|---|---|---|---|---|---|---|---|---|---|---|---|---|---|---|---|---|---|---|---|---|---|---|---|---|
| 1625560 | c13f | bff8 | 4000 | 0249 | 9007 | bfe0 | 8090 | 0008 | 3280 | 013c | c11f | bff8 | 1300 | 03d2 | 9212 | 6209 | 9410 | 2012 | 4000 | 0435 | 9010 | 2002 | 3100 | 0295 |
| 1625640 | ae10 | 2021 | 1080 | 0132 | ee26 | 21c8 | 3500 | 03d2 | b416 | a21c | b210 | 2001 | f227 | bfe0 | f427 | bfe4 | 1300 | 03d2 | e51a | 60b0 | e523 | a060 | d203 | a060 |
| 1625720 | e723 | a060 | d403 | a060 | 4000 | 0128 | 9010 | 2003 | c13f | bff8 | 4000 | 022d | 9007 | bfe0 | 8090 | 0008 | 3280 | 0120 | c11f | bff8 | 1300 | 03d2 | 9212 | 6222 |
| 1626000 | 9410 | 2014 | 4000 | 0419 | 9010 | 2002 | 3b00 | 0295 | b610 | 2021 | 1080 | 0116 | f627 | 61c8 | 1300 | 03d2 | 9010 | 2001 | d027 | bfe0 | 9212 | 6237 | d227 | bfe4 |
| 1626060 | 1500 | 03d2 | e91a | a0b0 | e93f | bff8 | 4000 | 0217 | 9007 | bfe0 | 8090 | 0008 | 3280 | 010a | c11f | bff8 | 1300 | 03d2 | 9212 | 623b | 9410 | 2017 | 4000 | 0403 |
| 1626140 | 9010 | 2002 | 9610 | 2021 | 1900 | 0295 | 1080 | 0100 | d623 | 21c8 | f507 | a044 | f707 | a048 | 1f00 | 03d2 | 9e13 | e253 | 9a10 | 2003 | da27 | bfe0 | de27 | bfe4 |
| 1626220 | 2100 | 03d2 | ed1c | 2040 | ed3f | bff8 | 2300 | 03d2 | f11c | 63c0 | 81ae | 8ad8 | 0100 | 0000 | 1980 | 0022 | 9210 | 001b | 4000 | 01fb | 9010 | 001a | c13f | bfd0 |
| 1626300 | ff07 | a050 | fd07 | a04c | f91f | bfd0 | 81af | 0a5e | 0100 | 0000 | 0390 | 0018 | 0100 | 0000 | c507 | a04c | c707 | a050 | 1100 | 03d2 | c11a | 20c8 | 89a0 | 0942 |
| 1626360 | c923 | a060 | d003 | a060 | cb23 | a060 | 4000 | 01e9 | d203 | a060 | c13f | bfc8 | d11f | bfc8 | cd1f | bfc8 | 95a1 | 8848 | d91f | bfd0 | 81ab | 0a4a | 0100 | 0000 |
| 1626440 | 1380 | 0005 | 0100 | 0000 | dd1f | bff8 | 91a0 | 00ae | dd3f | bff8 | 4000 | 01d9 | 9007 | bfe0 | 8090 | 0008 | 3280 | 00cc | c11f | bff8 | 2700 | 0295 | a410 | 2022 |
| 1626520 | 1080 | 00c7 | e424 | e1c8 | e907 | a044 | eb07 | a048 | 2b00 | 03d2 | aa15 | 6257 | a810 | 2004 | e827 | bfe0 | ea27 | bfe4 | 1100 | 03d2 | e11a | 20c0 | e13f | bff8 |
| 1626600 | e51a | 20c0 | 81ad | 0ad2 | 0100 | 0000 | 1980 | 0022 | 9210 | 001b | 4000 | 01c3 | 9010 | 001a | c13f | bfd0 | f307 | a050 | f107 | a04c | ed1f | bfd0 | 81ad | 8a58 |
| 1626660 | 0100 | 0000 | 0380 | 0018 | 0100 | 0000 | f907 | a04c | fb07 | a050 | 1100 | 03d2 | f51a | 20c8 | bda6 | 895c | fd23 | a060 | d003 | a060 | ff23 | a060 | 4000 | 01b1 |
| 1626740 | d203 | a060 | c13f | bfc8 | c51f | bfc8 | c11f | bfc8 | 89a0 | 0842 | cd1f | bfd0 | 81a9 | 8a44 | 0100 | 0000 | 1380 | 0005 | 0100 | 0000 | d11f | bff8 | 91a0 | 00a8 |
| 1627020 | d13f | bff8 | 4000 | 01a1 | 9007 | bfe0 | 8090 | 0008 | 3280 | 0094 | c11f | bff8 | 1080 | 008f | b010 | 2022 | 3700 | 03d2 | b616 | e25b | b410 | 2002 | f427 | bfe0 |
| 1627100 | f627 | bfe4 | 3b00 | 03d2 | d51f | 6040 | d53f | bff8 | b136 | 201f | 8090 | 0018 | 0280 | 0025 | 0100 | 0000 | d207 | a050 | 4000 | 018f | d007 | a04c | c13f | bfd0 |
| 1627160 | df07 | a050 | dd07 | a04c | d91f | bfd0 | 81ab | 0a4e | 0100 | 0000 | 0380 | 001a | 0100 | 0000 | e507 | a04c | e707 | a050 | 1100 | 03d2 | e11a | 20c8 | a9a4 | 0952 |
| 1627240 | e923 | a060 | d003 | a060 | eb23 | a060 | 4000 | 01bc | d203 | a060 | f51f | bfd0 | 1100 | 03d2 | ed1a | 20d0 | b1a5 | 8940 | 1300 | 03d2 | fd1a | 60b0 | b9a6 | 88d8 |
| 1627320 | 81af | 0a5e | 0100 | 0000 | 0380 | 0005 | 1500 | 03d2 | c11a | a040 | 81a0 | 00a0 | c13f | bff8 | 4000 | 016b | 9007 | bfe0 | 8090 | 0008 | 3280 | 005e | c11f | bff8 |
| 1627400 | 1300 | 03d2 | 9212 | 625f | 9410 | 2017 | 4000 | 0357 | 9010 | 2002 | 9610 | 2021 | 1900 | 0295 | 1080 | 0054 | d623 | 21c8 | 1f00 | 03d2 | 9e13 | e277 | 9a10 | 2001 |
| 1627460 | da27 | bfe0 | de27 | bfe4 | 1300 | 03d2 | c51a | 60b0 | c523 | a060 | d203 | a060 | c723 | a060 | d403 | a060 | 4000 | 004a | 9010 | 2003 | c13f | bff8 | 4000 | 014f |
| 1627540 | 9007 | bfe0 | 8090 | 0008 | 3280 | 0042 | c11f | bff8 | 1300 | 03d2 | 9212 | 627b | 9410 | 2020 | 4000 | 033b | 9010 | 2002 | 2300 | 0295 | a010 | 2021 | 1080 | 0038 |
| 1627620 | e024 | 61c8 | 2700 | 03d2 | a614 | e29c | 1300 | 03d2 | a410 | 2003 | e427 | bfe0 | e627 | bfe4 | 9212 | 6040 | d002 | 4000 | d202 | 6004 | d223 | a048 | c303 | a048 |
| 1627700 | 1320 | 0000 | b00e | 0009 | 902a | 0009 | 9012 | 0018 | d023 | a044 | c103 | a044 | c13f | bff8 | 4000 | 012f | 9007 | bfe0 | 8090 | 0008 | 3280 | 0022 | c11f | bff8 |
| 1627760 | 2b00 | 0295 | a810 | 2022 | 1080 | 001d | e825 | 61c8 | 2f00 | 03d2 | ae15 | e2a1 | ac10 | 2001 | ec27 | bfe0 | ee27 | bfe4 | 1300 | 03d2 | c91a | 60b0 | c923 | a060 |
| 1630040 | d203 | a060 | cb23 | a060 | d403 | a060 | 4000 | 0013 | 9010 | 2003 | c13f | bff8 | 4000 | 0118 | 9007 | bfe0 | 8090 | 0008 | 3280 | 000b | c11f | bff8 | 1300 | 03d2 |
| 1630120 | 9212 | 62a6 | 9410 | 2013 | 4000 | 0304 | 9010 | 2002 | b010 | 2021 | 3300 | 0295 | f026 | 61c8 | c11f | bff8 | 81c7 | e008 | 81e8 | 0000 | 9de3 | bf90 | c92b | a044 |
| 1630200 | fa03 | a044 | 1903 | e000 | 982f | 400c | d823 | a048 | c90b | a048 | bb37 | 6017 | ba0f | 601f | 8090 | 001d | 2280 | 000c | 1700 | 03d2 | c92b | a044 | d003 | a044 |
| 1630260 | 1903 | e000 | 920f | 601f | 932a | 6017 | 902a | 000c | 9212 | 4008 | d223 | a048 | c90b | a048 | 1700 | 03d2 | c022 | e370 | c92b | a044 | f803 | a044 | 1930 | 0000 |
| 1630340 | 982f | 000c | d823 | a044 | c90b | a044 | b937 | 201e | b80f | 2003 | 8090 | 001c | 2280 | 000d | 80a6 | 2003 | 920f | 2003 | d222 | e370 | c92b | a044 | d003 | a044 |
| 1630420 | 1930 | 0000 | 902a | 000c | 932a | 601e | 9212 | 4008 | d223 | a044 | c90b | a044 | 80a6 | 2003 | 1880 | 00d8 | 912e | 2002 | 1300 | 03c6 | 9212 | 61d8 | d002 | 0009 |
| 1630500 | 81c2 | 0000 | 0100 | 0000 | 000f | 19e8 | 000f | 1abc | 000f | 1ba0 | 000f | 1c7c | 808f | 6002 | 3280 | 0023 | 1300 | 03d2 | 1900 | 03d2 | c023 | 2374 | c92b | a044 |
| 1630560 | d203 | a044 | 942a | 63e0 | d423 | a044 | c90b | a044 | 9332 | 6005 | 920a | 601f | 9212 | 6002 | d223 | 2374 | c92b | a044 | d003 | a044 | 920a | 601f | 932a | 6005 |
| 1630640 | 902a | 23e0 | 9212 | 4008 | d223 | a044 | c90b | a044 | 1300 | 03d2 | 9212 | 6040 | d002 | 4000 | d202 | 6004 | d223 | a048 | c303 | a048 | 1320 | 0000 | b20e | 4009 |
| 1630720 | 902a | 0009 | 9012 | 0019 | d023 | a044 | c103 | a044 | 1080 | 00ab | c13f | bff8 | 9212 | 6078 | d002 | 4000 | d202 | 6004 | d223 | a048 | c303 | a048 | 1320 | 0000 |
| 1631000 | b20e | 4009 | 902a | 0009 | 9012 | 0019 | d023 | a044 | c103 | a044 | 1100 | 03d2 | c51a | 20d8 | 89a0 | 09c2 | 89a0 | 0024 | 1080 | 009a | c93f | bff8 | 808f | 6004 |
| 1631060 | 3280 | 0028 | 1300 | 03d2 | 8090 | 001c | 3280 | 0025 | 1300 | 03d2 | 1900 | 03d2 | c023 | 2374 | c92b | a044 | d203 | a044 | 942a | 63e0 | d423 | a044 | c90b | a044 |
| 1631140 | 9332 | 6005 | 920a | 601f | 9212 | 6005 | d223 | 2374 | c92b | a044 | d003 | a044 | 920a | 601f | 932a | 6005 | 902a | 23e0 | 9212 | 4008 | d223 | a044 | c90b | a044 |
| 1631220 | 1100 | 03d2 | cd1a | 20d8 | cd23 | a060 | d003 | a060 | cf23 | a060 | d203 | a060 | d223 | a048 | c303 | a048 | 1320 | 0000 | b20e | 4009 | 902a | 0009 | 9012 | 0019 |
| 1631300 | d023 | a044 | c103 | a044 | 1080 | 0071 | c13f | bff8 | 9212 | 6080 | d002 | 4000 | d202 | 6004 | d223 | a048 | c303 | a048 | 1320 | 0000 | b20e | 4009 | 902a | 0009 |
| 1631360 | 9012 | 0019 | d023 | a044 | c103 | a044 | 1300 | 03d2 | d11a | 6080 | 95a2 | 0940 | 1080 | 0061 | d53f | bff8 | 808f | 6008 | 3280 | 0026 | 1300 | 03d2 | 8090 | 001c |
| 1631440 | 3280 | 0023 | 1300 | 03d2 | 1900 | 03d2 | c023 | 2374 | c92b | a044 | d203 | a044 | 942a | 63e0 | d423 | a044 | c90b | a044 | 9332 | 6005 | 920a | 601f | 9212 | 6009 |
| 1631520 | d223 | 2374 | c92b | a044 | d003 | a044 | 920a | 601f | 932a | 6005 | 902a | 23e0 | 9212 | 4008 | d223 | a044 | c90b | a044 | 1300 | 03d2 | 9212 | 6040 | d002 | 4000 |
| 1631600 | d202 | 6004 | d223 | a048 | c303 | a048 | 1320 | 0000 | b20e | 4009 | 902a | 0009 | 9012 | 0019 | d023 | a044 | c103 | a044 | 1080 | 003a | c13f | bff8 | 9212 | 6078 |
| 1631660 | d002 | 4000 | d202 | 6004 | 1500 | 03d2 | d223 | a048 | c303 | a048 | 1320 | 0000 | b20e | 4009 | 902a | 0009 | 9012 | 0019 | d023 | a044 | d91a | a078 | c103 | a044 |
| 1631740 | 9da3 | 0940 | 1080 | 002a | dd3f | bff8 | 808f | 6010 | 3280 | 0023 | 1100 | 03d2 | 1900 | 03d2 | c023 | 2374 | c92b | a044 | d203 | a044 | 942a | 63e0 | d423 | a044 |
| 1632020 | c90b | a044 | 9332 | 6005 | 920a | 601f | 9212 | 6010 | d223 | 2374 | c92b | a044 | d003 | a044 | 920a | 601f | 932a | 6005 | 902a | 23e0 | 9212 | 4008 | d223 | a044 |
| 1632100 | c90b | a044 | 1300 | 03d2 | 9212 | 6030 | d002 | 4000 | d202 | 6004 | d223 | a048 | c303 | a048 | 1320 | 0000 | b20e | 4009 | 902a | 0009 | 9012 | 0019 | d023 | a044 |
| 1632160 | c103 | a044 | 1080 | 0006 | c13f | bff8 | e51a | 2040 | e11a | 2040 | a9a4 | 08d2 | e93f | bff8 | c11f | bff8 | 81c7 | e008 | 81e8 | 0000 | 81c3 | e008 | 9000 | 2000 |
| 1632240 | 1700 | 03d2 | 9612 | e300 | d222 | e00c | d022 | e008 | 1520 | 0000 | 920a | 000a | 902a | 000a | c11a | e008 | 1510 | cc00 | 80a2 | 000a | 0680 | 0005 | c51a | e010 |
| 1632320 | c51a | e020 | 81c3 | e008 | 81a0 | 08c2 | 8090 | 0009 | 0280 | 0008 | 0100 | 0000 | 85a0 | 00a2 | 81a0 | 0842 | 81a0 | 08c2 | 81a0 | 0120 | 81c3 | e008 | 81a0 | 00a0 |
| 1632400 | 81a0 | 0842 | 81a0 | 09c2 | 81c3 | e008 | 81a0 | 0120 | 9810 | 000f | 7fff | ffe3 | 0100 | 0000 | 9e10 | 000c | 81a0 | 1a40 | 1b00 | 03d2 | 9a13 | 6300 | c123 | 6000 |
| 1632460 | d003 | 6000 | 81c3 | e008 | 0100 | 0000 | 1700 | 03d2 | 9612 | e300 | c92a | e030 | da02 | e030 | 1520 | 0000 | 982b | 400a | 1510 | 0000 | 9813 | 000a | d822 | e034 |
| 1632540 | 9810 | 000f | c90a | e034 | 7fff | ffce | 0100 | 0000 | 9e10 | 000c | 1530 | 0000 | 9a0b | 400a | c92a | e034 | d802 | e034 | 982b | 000a | 9813 | 000d | d922 | e034 |
| 1632620 | c90a | e034 | 81c3 | e008 | 0100 | 0000 | 1700 | 03d2 | 9612 | e300 | c92a | e030 | da02 | e030 | 1530 | 0000 | 9813 | 400a | d822 | e034 | 9810 | 000f | c90a | e034 |

```
1632700  7fff ffb8 0100 c000 9e10 000c 1530 0000 9a0b 400a c92a e034 d802 e034 982b 000a 9813 000d d822 e034 c90a e034 81c3 e008
1632760  0100 0000 1700 03d2 9612 e300 c92a e030 da02 e030 1510 0000 982b 400a 1520 0000 9813 000a d922 e034 9810 000f c90a e034
1633040  7fff ffa0 0100 0000 9e10 000c 1530 0000 9a0b 400a c92a e034 d902 e034 982b 000a 9813 000d d822 e034 c90a e034 81c3 e008
1633120  0100 0000 1700 03d2 9612 e300 d022 e008 d222 e00c c92a e030 1520 0000 920a 000a 902a 000a d402 e018 c11a e008 80a2 000a
1633200  0680 0009 c51a e018 81a0 0120 81a0 0842 8090 0009 0280 0003 0100 0000 81a0 00a0 81a0 1a40 c51a e008 c90a e030 85a0 1a42
1633260  c122 e000 d002 e00c 81c3 e008 0100 0000 1700 03d2 9612 e300 c92a e030 d802 e030 d022 e000 1222 e004 1520 0000 982b 000a
1633340  9a0a 000a 902a 000a 1510 0000 9813 000a d822 e034 c90a e034 d022 e008 d222 e00c c11a e008 c51a e018 81a0 0120 81a0 0842
1633420  c13a e008 d002 e008 d202 e00c 9810 000f 7fff ff60 0100 0000 8090 000d 0280 0003 9e10 000c 81a0 00a0 c51a e000 81a8 0a42
1633500  da02 e030 9410 2021 1380 000a 0100 0000 0f80 0004 0100 0000 1080 0006 9a13 400a da22 e034 c90a e034 81c3 e008 85a0 8840
1633560  da22 e034 c90a e034 81c3 e008 0100 0000 1080 000b 8210 2000 8092 4008 1680 0008 821a 4008 8090 0009 1680 0004 8090 0008
1633640  1680 0003 9220 0009 9020 0008 9a92 4000 1280 0004 9610 0008 1080 009c 0100 0000 80a2 c00d 0a80 0094 9410 2000 0502 0000
1633720  80a2 c002 0a80 0027 9810 2000 80a3 4002 1a80 000d 8610 2001 9b2b 6004 10bf fffc 9803 2001 9a83 400d 1a80 0007 8600 e001
1634000  8528 a004 9b33 6001 9a03 4002 1080 0007 8620 e001 80a3 400b 0abf fff7 0100 0000 0280 0002 0100 0000 86a0 e001 0680 0075
1634060  0100 0000 9622 c00d 9410 2001 3080 0009 952a a001 0680 0005 9b33 6001 9622 c00d 1080 0004 9402 a001 9602 c00d 9422 a001
1634140  86a0 e001 16bf fff7 8090 000b 3080 0065 9b2b 6004 80a3 400b 08bf fffe 9883 2001 0280 0065 9823 2001 8090 000b 952a a004
1634220  0680 002f 9b33 6001 96a2 c00d 0680 0017 9b33 6001 96a2 c00d 0680 000b 9b33 6001 96a2 c00d 0680 0005 9b33 6001 96a2 c00d
1634300  1080 0050 9402 a00f 9682 c00d 1080 004d 9402 a00d 9682 c00d 0680 0005 9b33 6001 96a2 c00d 1080 0047 9402 a00b 9682 c00d
1634360  1080 0044 9402 a009 9682 c00d 0680 000b 9b33 6001 96a2 c00d 0680 0005 9b33 6001 96a2 c00d 1080 003b 9402 a007 9682 c00d
1634440  1080 0038 9402 a005 9682 c00d 0680 0005 9b33 6001 96a2 c00d 1080 0032 9402 a003 9682 c00d 1080 002f 9402 a001 9682 c00d
1634520  0680 0017 9b33 6001 96a2 c00d 0680 000b 9b33 6001 96a2 c00d 0680 0005 9b33 6001 96a2 c00d 1080 0023 9402 bfff 9682 c00d
1634600  1080 0020 9402 bffd 9682 c00d 0680 0005 9b33 6001 96a2 c00d 1080 001a 9402 bffb 9682 c00d 1080 0017 9402 bff9 9682 c00d
1634660  0680 000b 9b33 6001 96a2 c00d 0680 0005 9b33 6001 96a2 c00d 1080 000e 9402 bff7 9682 c00d 1080 000b 9402 bff5 9682 c00d
1634740  0680 0005 9b33 6001 96a2 c00d 1080 0005 9402 bff3 9682 c00d 1080 0002 9402 bff1 98a3 2001 16bf ffa2 8090 000b 2680 0002
1635020  9422 a001 8090 0001 2680 0002 9420 000a 81c3 e008 9010 000a 91d0 2002 81c3 e008 9010 2000 0000 0000 8182 0000 98aa 200f
1635100  0280 0038 1b3f ffc0 98aa 20ff 2280 0044 9923 0009 98aa 2fff 2280 0053 9923 0009 988a 000d 2280 0066 9923 0009 9888 0000
1635160  9923 0009 9923 0009 9923 0009 9923 0009 9923 0009 9923 0009 9923 0009 9923 0009 9923 0009 9923 0009 9923 0009 9923 0009
*
1635320  9923 0009 9923 0009 9923 0009 9923 0009 9923 0009 9923 0009 9923 0009 9923 0009 9923 0000 8090 0008 9140 0000 1680 0003
1635400  8090 0008 9823 0009 1680 0004 9210 000c 81c3 e008 80a2 7fff 81c3 e008 8082 4000 9923 0009 9923 0009 9923 0009 9923 0009
1635460  9923 0000 9b40 0000 912b 2004 9b33 601c 9093 4008 1680 0004 933b 201c 81c3 e008 80a2 7fff 81c3 e008 8082 4000 9923 0009
1635540  9923 0009 9923 0009 9923 0009 9923 0009 9923 0009 9923 0009 9923 0000 9b40 0000 912b 2008 9b33 6018 9093 4008 1680 0004
1635620  933b 2018 81c3 e008 80a2 7fff 81c3 e008 8082 4000 9923 0009 9923 0009 9923 0009 9923 0009 9923 0009 9923 0009 9923 0009
1635700  9923 0009 9923 0009 9923 0009 9923 0009 9923 0000 9b40 0000 912b 200c 9b33 6014 9093 4008 1680 0004 933b 2014 81c3 e008
1635760  80a2 7fff 81c3 e008 8082 4000 9923 0009 9923 0009 9923 0009 9923 0009 9923 0009 9923 0009 9923 0009 9923 0009 9923 0009
1636040  9923 0009 9923 0009 9923 0009 9923 0009 9923 0009 9923 0009 9923 0000 9b40 0000 912b 2010 9b33 6010 9093 4008 1680 0004
1636120  933b 2010 81c3 e008 80a2 7fff 81c3 e008 8082 4000 0000 0000 8210 2004 91d0 2000 1a80 0004 1b00 0345 9a13 61c0 81c3 4000
1636200  0100 0000 81c3 e008 0100 0000 0000 0000 000e e2a8 000e d488 000e c368 000e 98a4 000f 0898 000e 95b0 000e c340 000f 03c0
1636260  000e aa28 000e b074 000e b7a8 000e ac54 000e b354 000e bafc 000e e568 000e e570 000e e578 000e a800 000e a668 000e d0d8
1636340  000e cbc4 000e d940 000e d710 000e c928 000e 88dc 000e 8b00 000e 8c00 000e 8800 000e 96e8 000e ff68 000e 9214 000e 9318
1636420  000e 8dd8 000e 8e98 000e 8f90 000e 9450 000e 94b4 000e 8da0 0000 0000 0000 0000 4028 2329 3839 2f31 322f 3237 206d 6174
1636500  682e 6309 3336 2e32 0000 0000 0000 0000 c1b0 0000 0000 0000 41af ffff fe00 0000 3ff0 0000 0000 0000 0000 0000 0000 0000
1636560  3ff0 0000 0000 0000 41cd cd65 0000 0000 3fe6 2e42 fefa 39ef 3ee4 f8b5 88e3 68f1 3fb3 3333 3333 3333 3fc5 5555 5555 5555
1636640  3ff0 0000 0000 0000 bff0 0000 0000 0000 41cd cd65 0000 0000 3fe6 2e42 fefa 39ef 0000 0000 0000 0000 3f74 7ae1 47ae 147b
1636720  3e45 798e e230 8c3a 3fc9 9999 9999 999a 3fd5 5555 5555 5555 3ff0 0000 0000 0000 bfe0 0000 0000 0000 3ff0 0000 0000 0000
1637000  3ff0 0000 0000 0000 0000 0000 0000 0000 3ff0 0000 0000 0000 bff0 0000 0000 0000 bfe0 0000 0000 0000 3fe0 0000 0000 0000
1637060  3ff0 0000 0000 0000 3ff0 0000 0000 0000 3ff0 0000 0000 0000 3fe0 0000 0000 0000 0000 0000 0000 0000 4028 2329 6661 6273
1637140  2e53 2031 2e36 2038 382f 3032 2f30 3820 534d 4900 0000 0000 0000 0000 0000 0000 0000 0000 0000 0000 4028 2329 6965 6565
1637220  5f76 616c 732e 6320 312e 3320 3838 2f30 322f 3038 2053 4d49 0000 0000 0000 0000 0000 0000 0000 0000 3fe6 2e42 fefa 39ef
1637300  3fe6 2e42 fee0 0000 3dea 39ef 3579 3c76 7fff ffff ffff ffff 7ff0 0000 0000 0001 7ff0 0000 0000 0000 4330 0000 0000 0000
1637360  3cb0 0000 0000 0000 4009 21fb 5444 2d18 3ff6 a09e 667f 3bcd 4003 504f 333f 9de6 3ca2 1165 f626 cdd5 7fef ffff ffff ffff
1637440  0000 0000 0000 0001 0010 0000 0000 0000 000f ffff ffff ffff 4086 2e42 fefa 39ef c087 4910 d52d 3052 3ff7 1547 652b 82fe
1637520  4028 2329 6c64 6578 702e 6320 312e 3320 3838 2f30 322f 3038 2053 4d49 0000 0000 0000 0000 0000 0000 4028 2329 6d6f 6466
1637600  2e63 2031 2e32 2038 382f 3032 2f30 3820 534d 4900 0000 0000 0000 0000 0000 0000 4028 2329 706f 772e 6320 312e 3920 3838
1637660  2f30 322f 3038 2053 4d49 0000 0000 0000 0000 0000 0000 0000 3fe6 2e42 fefa 39ef 3fe6 2e42 fee0 0000 3dea 39ef 3579 3c76
1637740  7fff ffff ffff ffff 7ff0 0000 0000 0001 7ff0 0000 0000 0000 4330 0000 0000 0000 3cb0 0000 0000 0000 4009 21fb 5444 2d18
```

| | | | | | | | | | | | | | | | | | | | | | | | | |
|---|---|---|---|---|---|---|---|---|---|---|---|---|---|---|---|---|---|---|---|---|---|---|---|---|
| 1640020 | 3ff6 | a09e | 667f | 3bcd | 4003 | 504f | 333f | 9de6 | 3ca2 | 1165 | f626 | cdd5 | 7fef | ffff | ffff | ffff | 0000 | 0000 | 0000 | 0001 | 0010 | 0000 | 0000 | 0000 |
| 1640100 | 000f | ffff | ffff | ffff | 4086 | 2e42 | fefa | 39ef | c087 | 4910 | d52d | 3052 | 3ff7 | 1547 | 652b | 82fe | 0000 | 0000 | 0000 | 0000 | 3fe0 | 0000 | 0000 | 0000 |
| 1640160 | 3ff0 | 0000 | 0000 | 0000 | 4000 | 0000 | 0000 | 0000 | bff0 | 0000 | 0000 | 0000 | 3fe5 | 5555 | 5555 | 5592 | 3fd9 | 9999 | 9997 | ff24 | 3fd2 | 4924 | 941e | 07b4 |
| 1640240 | 3fcc | 71c5 | 2150 | bea6 | 3fc7 | 4663 | cc94 | 342f | 3fc3 | 9a1e | c014 | 045b | 3fc2 | f039 | f008 | 5122 | 3f8c | 70ff | 8b3c | c2cf | 3f01 | 5317 | df45 | 26c4 |
| 1640320 | 3fbc | 7195 | 3824 | 8597 | 3f50 | 3fc4 | cb8c | 98e8 | 0000 | 0000 | 0000 | 0000 | 3ff0 | 0000 | 0000 | 0000 | 3fe0 | 0000 | 0000 | 0000 | 3bfd | 83c9 | 4fb6 | d2ac |
| 1640400 | 3fe0 | 0000 | 0000 | 0000 | 4000 | 0000 | 0000 | 0000 | 0000 | 0000 | 0000 | 0000 | 3ff0 | 0000 | 0000 | 0000 | 4028 | 2329 | 6163 | 6f73 | 2e63 | 2031 | 2e34 | 2038 |
| 1640460 | 382f | 3032 | 2f30 | 3820 | 534d | 4900 | 0000 | 0000 | 0000 | 0000 | 0000 | 0000 | 3fe6 | 2e42 | fefa | 39ef | 3fe6 | 2e42 | fee0 | 0000 | 3dea | 39ef | 3579 | 3c76 |
| 1640540 | 7fff | ffff | ffff | ffff | 7ff0 | 0000 | 0000 | 0001 | 7ff0 | 0000 | 0000 | 0000 | 4330 | 0000 | 0000 | 0000 | 3cb0 | 0000 | 0000 | 0000 | 4009 | 21fb | 5444 | 2d18 |
| 1640620 | 3ff6 | a09e | 667f | 3bcd | 4003 | 504f | 333f | 9de6 | 3ca2 | 1165 | f626 | cdd5 | 7fef | ffff | ffff | ffff | 0000 | 0000 | 0000 | 0001 | 0010 | 0000 | 0000 | 0000 |
| 1640700 | 000f | ffff | ffff | ffff | 4086 | 2e42 | fefa | 39ef | c087 | 4910 | d52d | 3052 | 3ff7 | 1547 | 652b | 82fe | 3ff0 | 0000 | 0000 | 0000 | bff0 | 0000 | 0000 | 0000 |
| 1640760 | 0000 | 0000 | 0000 | 0000 | 4028 | 2329 | 6173 | 696e | 2e63 | 2031 | 2e35 | 2038 | 382f | 3032 | 2f30 | 3820 | 534d | 4900 | 0000 | 0000 | 0000 | 0000 | 0000 | 0000 |
| 1641040 | 3fe6 | 2e42 | fefa | 39ef | 3fe6 | 2e42 | fee0 | 0000 | 3dea | 39ef | 3579 | 3c76 | 7fff | ffff | ffff | ffff | 7ff0 | 0000 | 0000 | 0001 | 7ff0 | 0000 | 0000 | 0000 |
| 1641120 | 4330 | 0000 | 0000 | 0000 | 3cb0 | 0000 | 0000 | 0000 | 4009 | 21fb | 5444 | 2d18 | 3ff6 | a09e | 667f | 3bcd | 4003 | 504f | 333f | 9de6 | 3ca2 | 1165 | f626 | cdd5 |
| 1641200 | 7fef | ffff | ffff | ffff | 0000 | 0000 | 0000 | 0001 | 0010 | 0000 | 0000 | 0000 | 000f | ffff | ffff | ffff | 4086 | 2e42 | fefa | 39ef | c087 | 4910 | d52d | 3052 |
| 1641260 | 3ff7 | 1547 | 652b | 82fe | 3fe0 | 0000 | 0000 | 0000 | 3e11 | 2e0b | e826 | d695 | 41cd | cd65 | 0000 | 0000 | 3ff0 | 0000 | 0000 | 0000 | 0000 | 0000 | 0000 | 0000 |
| 1641340 | 4028 | 2329 | 6265 | 7373 | 656c | 2e63 | 2031 | 2e34 | 2038 | 382f | 3032 | 2f30 | 3820 | 534d | 4900 | 0000 | 0000 | 0000 | 0000 | 0000 | 3fe6 | 2e42 | fefa | 39ef |
| 1641420 | 3fe6 | 2e42 | fee0 | 0000 | 3dea | 39ef | 3579 | 3c76 | 7fff | ffff | ffff | ffff | 7ff0 | 0000 | 0000 | 0001 | 7ff0 | 0000 | 0000 | 0000 | 4330 | 0000 | 0000 | 0000 |
| 1641500 | 3cb0 | 0000 | 0000 | 0000 | 4009 | 21fb | 5444 | 2d18 | 3ff6 | a09e | 667f | 3bcd | 4003 | 504f | 333f | 9de6 | 3ca2 | 1165 | f626 | cdd5 | 7fef | ffff | ffff | ffff |
| 1641560 | 0000 | 0000 | 0000 | 0001 | 0010 | 0000 | 0000 | 0000 | 000f | ffff | ffff | ffff | 4086 | 2e42 | fefa | 39ef | c087 | 4910 | d52d | 3052 | 3ff7 | 1547 | 652b | 82fe |
| 1641640 | 0000 | 0000 | 0000 | 0000 | 3fe4 | 5f30 | 6dc9 | c883 | 3fe9 | 21fb | 5444 | 2d18 | 443a | bf01 | 5884 | a602 | c419 | 91a3 | c67d | cc60 | 43d6 | 2468 | 4a0e | 0535 |
| 1641720 | c37e | 5e05 | 8b55 | 76af | 4314 | 6227 | 2284 | 63e0 | c29d | 69f3 | 2636 | 972d | 4217 | 5987 | fa1d | 79ac | c183 | 5059 | ddbf | 247f | 40da | 3a77 | 96a5 | c97c |
| 1642000 | 443a | bf01 | 5884 | a602 | 43d2 | d5d9 | 206d | 9a22 | 435a | d139 | a4c5 | bc59 | 42d9 | a468 | 7f1d | 5af6 | 4252 | 2db2 | 6731 | 87c4 | 41c3 | f7af | 57a6 | 2c34 |
| 1642060 | 4131 | 020c | 1934 | dec6 | 4095 | 4c41 | 2e13 | 7cf9 | 3ff0 | 0000 | 0000 | 0000 | 4154 | 9313 | 455e | 1dec | 4167 | 85ac | 1894 | e6a2 | 4160 | 0bee | 2e9c | 0fab |
| 1642140 | 413e | c387 | 4875 | f6b7 | 4102 | cbf5 | 39e1 | a1ed | 40a3 | 6a8b | 3a45 | b5c5 | 0000 | 0000 | 0000 | 0000 | 4154 | 9313 | 455e | 1dec | 4167 | 8890 | c74a | a7df |
| 1642220 | 4160 | 127a | 219e | c261 | 413e | e66a | cd33 | b347 | 4103 | 0b0d | d251 | 3bc6 | 40a4 | 6f66 | c6fd | 5c36 | 3ff0 | 0000 | 0000 | 0000 | c0af | 213c | 164b | 72d6 |
| 1642300 | c0c4 | 46b5 | 5fd8 | 8cb0 | c0c0 | 1788 | 7cf5 | d5fb | c0a2 | 7be9 | 8f37 | 6352 | c06c | 486b | 0599 | 68c9 | c013 | 8c7d | ff98 | ad3d | 0000 | 0000 | 0000 | 0000 |
| 1642360 | 410f | 213c | 164b | 72d6 | 4124 | 58f2 | d90d | 9ce3 | 4120 | 4656 | ba12 | 6860 | 4103 | 0baa | 90ba | 58e5 | 40ce | ac72 | 2a46 | 9886 | 4079 | 8c57 | ee32 | dd7d |
| 1642440 | 3ff0 | 0000 | 0000 | 0000 | c3f7 | dadc | fa02 | dc52 | 440c | 9190 | 8363 | 136f | c3d2 | 3454 | 9622 | d9eb | 437e | 8b84 | d805 | 655c | c317 | 6d97 | d06e | 9706 |
| 1642520 | 42a2 | a774 | 218a | ffe3 | c220 | 0079 | 45cb | 94b0 | 418c | 34b8 | 3541 | 447b | c0e4 | 334b | 5bfd | 9d70 | 4434 | 3380 | 210b | 1480 | 43cd | 173a | 8b57 | 65f5 |
| 1642600 | 4355 | 40c9 | 3f7d | fd8f | 42d4 | d502 | 0e5c | 83f7 | 424e | 6b8a | f548 | 0dd7 | 41c1 | 4553 | e408 | f827 | 412e | 91cd | 4857 | 04ff | 4094 | 09cf | a396 | b73b |
| 1642660 | 3ff0 | 0000 | 0000 | 0000 | 443f | 81c2 | e523 | 683d | c40c | ef86 | bded | 9999 | 43c0 | 12d0 | 08c7 | bcea | c35f | e006 | c30b | a161 | 42f0 | 88da | ad7a | f759 |
| 1642740 | c273 | 407f | 5dc0 | c206 | 41e9 | 6e3a | 40c9 | a788 | c151 | e9b2 | 61f6 | 0e0a | 40a5 | 1a3e | d3f6 | 4ac9 | 444f | 81c2 | e523 | 683d | 43e4 | 91e1 | 39ae | 7522 |
| 1643020 | 436b | 0ddf | 388a | 59f6 | 42e7 | aa6e | 7871 | a918 | 425e | 85bc | b84a | 30f5 | 41ce | 372a | 2d2d | e908 | 4136 | ea61 | 9851 | d3ca | 4099 | 1bb9 | ee66 | 133e |
| 1643100 | 3ff0 | 0000 | 0000 | 0000 | c150 | ebcb | 7446 | 5ae1 | c162 | f69c | d029 | 9896 | c159 | 309b | 4fe5 | 360f | c137 | 3f49 | 59e7 | 01cc | c0fa | d000 | e30f | 6260 |
| 1643160 | c099 | 2e77 | 719c | 1ddc | 0000 | 0000 | 0000 | 0000 | c150 | ebcb | 7446 | 5ae1 | c162 | f2a5 | 8c7a | 5819 | c159 | 1efe | deb3 | c877 | c137 | 1181 | 81b2 | c6c0 |
| 1643240 | c0fa | 2ffd | c232 | 13a9 | c096 | bc09 | aab0 | 75cc | 3ff0 | 0000 | 0000 | 0000 | 40e0 | 389d | 3aa7 | 4f14 | 40f4 | c992 | 9220 | 4d02 | 40f0 | 282d | 62a3 | 0aeb |
| 1643320 | 40d2 | 0f90 | d2ea | 36e0 | 409a | a980 | 7077 | 18ac | 4041 | a1ef | e7e8 | 2ea6 | 0000 | 0000 | 0000 | 0000 | 4125 | a0d1 | a389 | bec5 | 413b | c342 | 0ad0 | 80ab |
| 1643400 | 4135 | a8c4 | ab6b | 2643 | 4118 | 6e99 | be48 | 4c46 | 40e2 | 8947 | 5a13 | ce40 | 408a | feb1 | b81e | 7b1f | 3ff0 | 0000 | 0000 | 0000 | c4b5 | 195c | 8ed3 | ca48 |
| 1643460 | 4496 | 7e24 | 182f | 7761 | c450 | 6e00 | 86e7 | cb12 | 43f3 | 05ad | 30f8 | d05a | c385 | d363 | 62a3 | 2862 | 430b | 330a | 69fb | 0b43 | c282 | c6e4 | edd9 | 939c |
| 1643540 | 41eb | 1dc6 | 0483 | f7d3 | c140 | 16d7 | c523 | 150b | 0000 | 0000 | 0000 | 0000 | 44da | e77c | 5047 | 2767 | 4472 | 6a61 | 5868 | b701 | 43f9 | a164 | 2b70 | b24a |
| 1643620 | 4378 | 07ed | 0b6b | ac22 | 42f0 | eb91 | e0c3 | 0f7b | 4262 | d10d | e8b7 | d0e2 | 41d0 | d199 | 3d4a | d824 | 4137 | da92 | c141 | 1952 | 4099 | 3171 | b1c3 | 7e6b |
| 1643700 | 3ff0 | 0000 | 0000 | 0000 | 0000 | 0000 | 0000 | 0000 | 4020 | 0000 | 0000 | 0000 | 0000 | 0000 | 0000 | 0000 | 4020 | 0000 | 0000 | 0000 | 4050 | 0000 | 0000 | 0000 |
| 1643760 | 0000 | 0000 | 0000 | 0000 | 4020 | 0000 | 0000 | 0000 | 0000 | 0000 | 0000 | 0000 | 4020 | 0000 | 0000 | 0000 | 3ff0 | 0000 | 0000 | 0000 | 4008 | 0000 | 0000 | 0000 |
| 1644040 | 0000 | 0000 | 0000 | 0000 | 4020 | 0000 | 0000 | 0000 | 4008 | 0000 | 0000 | 0000 | 3ff0 | 0000 | 0000 | 0000 | 4050 | 0000 | 0000 | 0000 | 0000 | 0000 | 0000 | 0000 |
| 1644120 | 4020 | 0000 | 0000 | 0000 | 0000 | 0000 | 0000 | 0000 | 4000 | 0000 | 0000 | 0000 | 3ff0 | 0000 | 0000 | 0000 | 0000 | 0000 | 0000 | 0000 | 4000 | 0000 | 0000 | 0000 |
| 1644200 | 4028 | 2329 | 6c67 | 616d | 6d61 | 2e63 | 2031 | 2e35 | 2038 | 382f | 3032 | 2f30 | 3820 | 534d | 4900 | 0000 | 0000 | 0000 | 0000 | 0000 | 3fe6 | 2e42 | fefa | 39ef |
| 1644260 | 3fe6 | 2e42 | fee0 | 0000 | 3dea | 39ef | 3579 | 3c76 | 7fff | ffff | ffff | ffff | 7ff0 | 0000 | 0000 | 0001 | 7ff0 | 0000 | 0000 | 0000 | 4330 | 0000 | 0000 | 0000 |
| 1644340 | 3cb0 | 0000 | 0000 | 0000 | 4009 | 21fb | 5444 | 2d18 | 3ff6 | a09e | 667f | 3bcd | 4003 | 504f | 333f | 9de6 | 3ca2 | 1165 | f626 | cdd5 | 7fef | ffff | ffff | ffff |
| 1644420 | 0000 | 0000 | 0000 | 0001 | 0010 | 0000 | 0000 | 0000 | 000f | ffff | ffff | ffff | 4086 | 2e42 | fefa | 39ef | c087 | 4910 | d52d | 3052 | 3ff7 | 1547 | 652b | 82fe |
| 1644500 | 0000 | 0000 | 0000 | 0000 | 3fed | 67f1 | c864 | beb5 | 4009 | 21fb | 5444 | 2d18 | 3fb5 | 5555 | 5555 | 5545 | bf66 | c16c | 16b2 | acec | 3f4a | 019f | a29f | 7264 |
| 1644560 | bf43 | 80d0 | 1e4f | 7b8c | 3f4b | 68b9 | 9273 | 8fbf | bf5a | c321 | 0347 | 83f9 | c0e4 | ae36 | 1076 | bd24 | c0d4 | 65b7 | 278e | 2e8d | c0c1 | 1d5a | eb0a | 3eb3 |
| 1644640 | c09f | 621c | 0f16 | 9a87 | c07b | 7549 | 7fb5 | ef7c | c049 | 0de9 | ad49 | 2516 | c01a | fad4 | 5cdd | 0692 | 0000 | 0000 | 0000 | 0000 | c0e4 | ae36 | 1076 | bd24 |
| 1644720 | c0a7 | 48c5 | 4a18 | 57bd | 40c3 | 6a27 | 5960 | 9f66 | c097 | e26d | d92d | 7b10 | c07f | 3074 | d854 | a256 | 4067 | aff1 | 88c2 | 45ef | c037 | 14e0 | 8f8b | 02b5 |
| 1645000 | 3ff0 | 0000 | 0000 | 0000 | 0000 | 0000 | 0000 | 0000 | 4020 | 0000 | 0000 | 0000 | 5f13 | 8d35 | 2e50 | 96af | 3ff0 | 0000 | 0000 | 0000 | 0000 | 0000 | 0000 | 0000 |
| 1645060 | 3fe0 | 0000 | 0000 | 0000 | 3fe0 | 0000 | 0000 | 0000 | 4000 | 0000 | 0000 | 0000 | 0000 | 0000 | 0000 | 0000 | 4000 | 0000 | 0000 | 0000 | 3ff0 | 0000 | 0000 | 0000 |

| | | | | | | | | | | | | | | | | | | | | | | | | |
|---|---|---|---|---|---|---|---|---|---|---|---|---|---|---|---|---|---|---|---|---|---|---|---|---|
| 1645140 | 4008 | 0000 | 0000 | 0000 | 0000 | 0000 | 0000 | 0000 | 4028 | 2329 | 6c6f | 6731 | 302e | 6320 | 312e | 3620 | 3838 | 2f30 | 322f | 3038 | 2053 | 4d49 | 0000 | 0000 |
| 1645220 | 0000 | 0000 | 0000 | 0000 | 3fe6 | 2e42 | fefa | 39ef | 3fe6 | 2e42 | fee0 | 0000 | 3dea | 39ef | 3579 | 3c76 | 7fff | ffff | ffff | ffff | 7ff0 | 0000 | 0000 | 0001 |
| 1645300 | 7ff0 | 0000 | 0000 | 0000 | 4330 | 0000 | 0000 | 0000 | 3cb0 | 0000 | 0000 | 0000 | 4009 | 21fb | 5444 | 2d18 | 3ff6 | a09e | 667f | 3bcd | 4003 | 504f | 333f | 9de6 |
| 1645360 | 3ca2 | 1165 | f626 | cdd5 | 7fef | ffff | ffff | ffff | 0000 | 0000 | 0000 | 0001 | 0010 | 0000 | 0000 | 0000 | 000f | ffff | ffff | ffff | 4086 | 2e42 | fefa | 39ef |
| 1645440 | c087 | 4910 | d52d | 3052 | 3ff7 | 1547 | 652b | 82fe | 3fdb | cb7b | 1526 | e50e | 3f13 | 4413 | 509f | 6000 | 3d59 | fef3 | 11f1 | 2b36 | 0000 | 0000 | 0000 | 0000 |
| 1645520 | 4028 | 2329 | 7265 | 6d61 | 696e | 6465 | 722e | 5320 | 312e | 3130 | 2038 | 382f | 3032 | 2f30 | 3820 | 436f | 7079 | 7220 | 3139 | 3837 | 2053 | 756e | 204d | 6963 |
| 1645600 | 726f | 0000 | 0000 | 0000 | 0000 | 0000 | 0000 | 0000 | 0000 | 0000 | 0000 | 0000 | 0000 | 0000 | 0000 | 0000 | 3fe0 | 0000 | 0000 | 0000 | 0000 | 0000 | 0000 | 0000 |
| 1645660 | 0000 | 0000 | 0000 | 0000 | 4028 | 2329 | 666d | 6f64 | 2e53 | 2031 | 2e36 | 2038 | 382f | 3032 | 2f30 | 3820 | 436f | 7079 | 7220 | 3139 | 3836 | 2053 | 756e | 204d |
| 1645740 | 6963 | 726f | 0000 | 0000 | 0000 | 0000 | 0000 | 0000 | 0000 | 0000 | 0000 | 0000 | 0000 | 0000 | 0000 | 0000 | 4710 | 0000 | 0000 | 0000 | 0000 | 0000 | 0000 | 0000 |
| 1646020 | 0000 | 0000 | 0000 | 0000 | 3840 | 0000 | 0000 | 0000 | 0000 | 0000 | 0000 | 0000 | 0000 | 0000 | 0000 | 0000 | 0000 | 0000 | 0000 | 0000 | 3ff0 | 0000 | 0000 | 0000 |
| 1646100 | 4000 | 0000 | 0000 | 0000 | 3ddb | 7cdf | d9d7 | bdbb | 4202 | a05f | 2000 | 0000 | 4036 | 0000 | 0000 | 0000 | 3ff0 | 0000 | 0000 | 0000 | 4028 | 2329 | 6174 | 616e |
| 1646160 | 322e | 6320 | 312e | 3520 | 3838 | 2f30 | 322f | 3038 | 2053 | 4d49 | 0000 | 0000 | 0000 | 0000 | 0000 | 0000 | 3fe6 | 2e42 | fefa | 39ef | 3fe6 | 2e42 | fee0 | 0000 |
| 1646240 | 3dea | 39ef | 3579 | 3c76 | 7fff | ffff | ffff | ffff | 7ff0 | 0000 | 0000 | 0001 | 7ff0 | 0000 | 0000 | 0000 | 4330 | 0000 | 0000 | 0000 | 3cb0 | 0000 | 0000 | 0000 |
| 1646320 | 4009 | 21fb | 5444 | 2d18 | 3ff6 | a09e | 667f | 3bcd | 4003 | 504f | 333f | 9de6 | 3ca2 | 1165 | f626 | cdd5 | 7fef | ffff | ffff | ffff | 0000 | 0000 | 0000 | 0001 |
| 1646400 | 0010 | 0000 | 0000 | 0000 | 000f | ffff | ffff | ffff | 4086 | 2e42 | fefa | 39ef | c087 | 4910 | d52d | 3052 | 3ff7 | 1547 | 652b | 82fe | 3fe9 | 21fb | 5444 | 2d18 |
| 1646460 | 3ff9 | 21fb | 5444 | 2d18 | 4009 | 21fb | 5444 | 2d18 | 3ca1 | a626 | 3314 | 5c07 | 3ca1 | a600 | 0000 | 0000 | 0000 | 0000 | 0000 | 0000 | 0000 | 0000 | 0000 | 0000 |
| 1646540 | 3ff0 | 0000 | 0000 | 0000 | 4008 | 0000 | 0000 | 0000 | c008 | 0000 | 0000 | 0000 | 3fe0 | 0000 | 0000 | 0000 | 0000 | 0000 | 0000 | 0000 | 4028 | 2329 | 6174 | 616e |
| 1646620 | 2e53 | 2031 | 2e38 | 2038 | 382f | 3032 | 2f30 | 3820 | 534d | 4900 | 0000 | 0000 | 3fdd | ac67 | 0561 | bb4f | 3fe9 | 21fb | 5444 | 2d18 | 3fef | 730b | d281 | f69b |
| 1646700 | 3ff9 | 21fb | 5444 | 2d18 | 3c55 | 543b | 8f25 | 3271 | 0000 | 0000 | 0000 | 0000 | bc7c | 23df | efea | e6b5 | 0000 | 0000 | 0000 | 0000 | 3c7a | 2b7f | 222f | 65e2 |
| 1646760 | 3c81 | a626 | 3314 | 5c07 | 3c70 | 0788 | 7af0 | cbbd | 3c91 | a626 | 3314 | 5c07 | 3fd5 | 5555 | 5555 | 55c3 | bfc9 | 9999 | 9999 | 7ccd | 3fc2 | 4924 | 921e | c1d7 |
| 1647040 | bfbc | 71c7 | 059a | f280 | 3fb7 | 45ce | 5aa3 | 5db2 | bfb3 | b0fa | 54be | c400 | 3fb1 | 0da9 | 2459 | 7fff | bfad | e125 | fddb | d793 | 3fa9 | 8605 | 24bd | d807 |
| 1647120 | bfa2 | ca6c | 94c6 | 937a | 3f90 | d521 | 74a1 | bb54 | 3fd5 | 5555 | 5555 | 550d | bfc9 | 9999 | 9998 | ebc4 | 3fc2 | 4924 | 9200 | 83ff | bfbc | 71c6 | fe23 | 1671 |
| 1647200 | 3fb7 | 45cd | c54c | 296e | bfb3 | b0f2 | af74 | 9a6d | 3fb1 | 0d65 | a0d0 | 3d51 | bfad | de2d | 52de | fd9a | 3fa9 | 7b4b | 2476 | 0deb | bfa2 | b444 | 2c6a | 6c2f |
| 1647260 | 3f90 | ad3a | e322 | da11 | 0000 | 0000 | 0000 | 0000 | 0000 | 0000 | 0000 | 0000 | 3ddb | 7cdf | d9d7 | bdbb | 3fe0 | 0000 | 0000 | 0000 | 3ff0 | 0000 | 0000 | 0000 |
| 1647340 | 3ff8 | 0000 | 0000 | 0000 | 4000 | 0000 | 0000 | 0000 | 4003 | 8000 | 0000 | 0000 | 3fdc | 0000 | 0000 | 0000 | 3fe6 | 0000 | 0000 | 0000 | 3ff3 | 0000 | 0000 | 0000 |
| 1647420 | 4415 | af1d | 78b5 | 8c40 | 3e20 | 0000 | 0000 | 0000 | 3f10 | 0000 | 0000 | 0000 | 3f50 | 0000 | 0000 | 0000 | 3f88 | 4060 | 03d7 | 1337 | 000f | 3678 | 000f | 36f0 |
| 1647500 | 0000 | 0000 | 0000 | 0000 | 0000 | 0000 | 0000 | 0000 | 4028 | 2329 | 6c6f | 672e | 5320 | 312e | 3132 | 2038 | 382f | 3032 | 2f30 | 3820 | 534d | 4900 | 0000 | 0000 |
| 1647560 | 3fe5 | 5555 | 5555 | 5592 | 3fd9 | 9999 | 9997 | ff24 | 3fd2 | 4924 | 941e | 07b4 | 3fcc | 71c5 | 2150 | bea6 | 3fc7 | 4663 | cc94 | 342f | 3fc3 | 9a1e | c014 | 045b |
| 1647640 | 3fc2 | f039 | f008 | 5122 | 0000 | 0000 | 0000 | 0000 | 4350 | 0000 | 0000 | 0000 | 3fe0 | 0000 | 0000 | 0000 | bff0 | 0000 | 0000 | 0000 | 0000 | 0000 | 0000 | 0000 |
| 1647720 | 3ff0 | 0000 | 0000 | 0000 | 3fe6 | 2e42 | fee0 | 0000 | 3dea | 39ef | 3579 | 3c76 | 0009 | 5f60 | 0000 | 0000 | 0000 | 0000 | 0000 | 0000 | 0000 | 0000 | 0000 | 0000 |
| 1650000 | 7ff0 | 0000 | 0000 | 0000 | 4000 | 0000 | 0000 | 0000 | 0000 | 0000 | 0000 | 0000 | 4028 | 2329 | 636f | 7368 | 2e63 | 2031 | 2e35 | 2038 | 382f | 3032 | 2f30 | 3820 |
| 1650060 | 534d | 4900 | 0000 | 0000 | 0000 | 0000 | 0000 | 0000 | 3fe6 | 2e42 | fefa | 39ef | 3fe6 | 2e42 | fee0 | 0000 | 3dea | 39ef | 3579 | 3c76 | 7fff | ffff | ffff | ffff |
| 1650140 | 7ff0 | 0000 | 0000 | 0001 | 7ff0 | 0000 | 0000 | 0000 | 4330 | 0000 | 0000 | 0000 | 3cb0 | 0000 | 0000 | 0000 | 4009 | 21fb | 5444 | 2d18 | 3ff6 | a09e | 667f | 3bcd |
| 1650220 | 4003 | 504f | 333f | 9de6 | 3ca2 | 1165 | f626 | cdd5 | 7fef | ffff | ffff | ffff | 0000 | 0000 | 0000 | 0001 | 0010 | 0000 | 0000 | 0000 | 000f | ffff | ffff | ffff |
| 1650300 | 4086 | 2e42 | fefa | 39ef | c087 | 4910 | d52d | 3052 | 3ff7 | 1547 | 652b | 82fe | 3fd6 | 2d0e | 5604 | 1893 | 3ff0 | 0000 | 0000 | 0000 | 4036 | 0000 | 0000 | 0000 |
| 1650360 | 3fe0 | 0000 | 0000 | 0000 | 4090 | 0000 | 0000 | 0000 | 4028 | 2329 | 7369 | 6e68 | 2e63 | 2031 | 2e36 | 2038 | 382f | 3032 | 2f30 | 3820 | 534d | 4900 | 0000 | 0000 |
| 1650440 | 0000 | 0000 | 0000 | 0000 | 3fe6 | 2e42 | fefa | 39ef | 3fe6 | 2e42 | fee0 | 0000 | 3dea | 39ef | 3579 | 3c76 | 7fff | ffff | ffff | ffff | 7ff0 | 0000 | 0000 | 0001 |
| 1650520 | 7ff0 | 0000 | 0000 | 0000 | 4330 | 0000 | 0000 | 0000 | 3cb0 | 0000 | 0000 | 0000 | 4009 | 21fb | 5444 | 2d18 | 3ff6 | a09e | 667f | 3bcd | 4003 | 504f | 333f | 9de6 |
| 1650600 | 3ca2 | 1165 | f626 | cdd5 | 7fef | ffff | ffff | ffff | 0000 | 0000 | 0000 | 0001 | 0010 | 0000 | 0000 | 0000 | 000f | ffff | ffff | ffff | 4086 | 2e42 | fefa | 39ef |
| 1650660 | c087 | 4910 | d52d | 3052 | 3ff7 | 1547 | 652b | 82fe | 3ff0 | 0000 | 0000 | 0000 | 3fe0 | 0000 | 0000 | 0000 | 408f | 4000 | 0000 | 0000 | 4090 | 0000 | 0000 | 0000 |
| 1650740 | 4028 | 2329 | 6578 | 706d | 312e | 6320 | 312e | 3620 | 3838 | 2f30 | 322f | 3038 | 2053 | 4d49 | 0000 | 0000 | 0000 | 0000 | 0000 | 0000 | 3fe6 | 2e42 | fefa | 39ef |
| 1651020 | 3fe6 | 2e42 | fee0 | 0000 | 3dea | 39ef | 3579 | 3c76 | 7fff | ffff | ffff | ffff | 7ff0 | 0000 | 0000 | 0001 | 7ff0 | 0000 | 0000 | 0000 | 4330 | 0000 | 0000 | 0000 |
| 1651100 | 3cb0 | 0000 | 0000 | 0000 | 4009 | 21fb | 5444 | 2d18 | 3ff6 | a09e | 667f | 3bcd | 4003 | 504f | 333f | 9de6 | 3ca2 | 1165 | f626 | cdd5 | 7fef | ffff | ffff | ffff |
| 1651160 | 0000 | 0000 | 0000 | 0001 | 0010 | 0000 | 0000 | 0000 | 000f | ffff | ffff | ffff | 4086 | 2e42 | fefa | 39ef | c087 | 4910 | d52d | 3052 | 3ff7 | 1547 | 652b | 82fe |
| 1651240 | 3ff0 | 0000 | 0000 | 0000 | 3fe0 | 0000 | 0000 | 0000 | 0000 | 0035 | 0000 | 0000 | 3f8c | 70ff | 8b3c | c2cf | 3f01 | 5317 | df45 | 26c4 | 3fbc | 7195 | 3824 | 8597 |
| 1651320 | 3f50 | 3fc4 | cb8c | 98e8 | 0000 | 0000 | 0000 | 0000 | 3ff0 | 0000 | 0000 | 0000 | 3fe0 | 0000 | 0000 | 0000 | 0000 | 0000 | 0000 | 0000 | bff0 | 0000 | 0000 | 0000 |
| 1651400 | bfd6 | 2e42 | fefa | 39ef | bc67 | 0ef5 | 4646 | d497 | bfe6 | 2e42 | fefa | 39ef | 3fe0 | 0000 | 0000 | 0000 | c044 | 0000 | 0000 | 0000 | 3ff0 | 0000 | 0000 | 0000 |
| 1651460 | 01a5 | 6e1f | c2f8 | f359 | 3fd6 | 2e42 | fefa | 39ef | 3c67 | 0ef5 | 4646 | d497 | 3ff0 | a2b2 | 3f3b | ab73 | 3fdc | 5c85 | fdf4 | 73de | 4051 | 8000 | 0000 | 0000 |
| 1651540 | 4028 | 2329 | 6578 | 702e | 5320 | 312e | 3920 | 3838 | 2f30 | 322f | 3038 | 2053 | 4d49 | 0000 | 0000 | 0000 | 3fc5 | 5555 | 5555 | 553e | bf66 | c16c | 16be | bd93 |
| 1651620 | 3f11 | 566a | af25 | de2c | bebb | bd41 | c5d2 | 6bf1 | 3e66 | 3769 | 72be | a4d0 | 0000 | 0000 | 0000 | 0000 | 7fef | ffff | ffff | ffff | 0000 | 0000 | 0000 | 0001 |
| 1651700 | 3ff7 | 1547 | 652b | 82fe | 4330 | 0000 | 0000 | 0000 | 3fe6 | 2e42 | fee0 | 0000 | 3dea | 39ef | 3579 | 3c76 | 4000 | 0000 | 0000 | 0000 | 3ff0 | 0000 | 0000 | 0000 |
| 1651760 | 0020 | 0000 | 0000 | 0000 | 7fc0 | 0000 | 0000 | 0000 | 0000 | 0000 | 0000 | 0000 | 3fe0 | 0000 | 0000 | 0000 | 3fd6 | 2e42 | fefa | 39ef | 0000 | 0000 | 0000 | 0000 |
| 1652040 | 0000 | 0000 | 0000 | 0000 | 4086 | 2e42 | fefa | 39ef | c087 | 4910 | d52d | 3052 | 0000 | 0000 | 0000 | 0000 | 4028 | 2329 | 7472 | 6967 | 2e53 | 2031 | 2e31 | 3220 |
| 1652120 | 3838 | 2f30 | 322f | 3038 | 2053 | 4d49 | 0000 | 0000 | 0000 | 0000 | 0000 | 0000 | 3ff9 | 21fb | 5444 | 2d18 | 4009 | 21fb | 5444 | 2d18 | 4012 | d97c | 7f33 | 21d2 |
| 1652200 | 4019 | 21fb | 5444 | 2d18 | 401f | 6a7a | 2955 | 385e | 4022 | d97c | 7f33 | 21d2 | 0000 | 0000 | 0000 | 0000 | 3c91 | a626 | 3314 | 5c07 | 3ca1 | a626 | 3314 | 5c07 |

| | | | | | | | | | | | | | | | | | | | | | | | | |
|---|---|---|---|---|---|---|---|---|---|---|---|---|---|---|---|---|---|---|---|---|---|---|---|---|
| 1652260 | 3caa | 7939 | 4c9e | 8a0a | 3cb1 | a626 | 3314 | 5c07 | 3cb6 | 0faf | bfd9 | 7309 | 3cba | 7939 | 4c9e | 8a0a | 0000 | 0000 | 0000 | 0000 | 0000 | 0000 | 0000 | 0000 |
| 1652340 | 3c91 | a600 | 0000 | 0000 | 3ca1 | a600 | 0000 | 0000 | 3caa | 7900 | 0000 | 0000 | 3cb1 | a600 | 0000 | 0000 | 3cb6 | 0f80 | 0000 | 0000 | 3cba | 7900 | 0000 | 0000 |
| 1652420 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 |
| 1652500 | 0000 | 0000 | 0000 | 0000 | 0000 | 0000 | 0000 | 0000 | 0000 | 0000 | 0000 | 0000 | 3fa5 | 5555 | 5555 | 554c | bf56 | c16c | 16c1 | 521f | 3efa | 01a0 | 19cb | f671 |
| 1652560 | be92 | 7e4f | 812b | 495b | 3e21 | ee9f | 14cd | c590 | bda8 | fb12 | baf5 | 9d4b | 0000 | 0000 | 0000 | 0000 | 0000 | 0000 | 0000 | 0000 | 3fa5 | 5555 | 5555 | 554c |
| 1652640 | bf56 | c16c | 16c1 | 521f | 3efa | 01a0 | 19cb | f671 | be92 | 7e4f | 812b | 495b | 3e21 | ee9f | 14cd | c590 | bda8 | fb12 | baf5 | 9d4b | 0000 | 0000 | 0000 | 0000 |
| 1652720 | 0000 | 0000 | 0000 | 0000 | 3fa5 | 5555 | 5555 | 553e | bf56 | c16c | 16c1 | 4199 | 3efa | 01a0 | 1971 | caeb | be92 | 7e4f | 1314 | a11a | 3e21 | ee3b | 60dd | dc8c |
| 1653000 | bda8 | bd59 | 86b2 | a52e | 0000 | 0000 | 0000 | 0000 | 0000 | 0000 | 0000 | 0000 | 3fc5 | 5555 | 5555 | 555a | bf81 | 1111 | 1111 | 0d97 | 3f2a | 01a0 | 19e4 | a9ac |
| 1653060 | bec7 | 1de3 | 7262 | ecf8 | 3e5a | e5f9 | 3356 | 9b98 | bde5 | de23 | ad24 | 95f2 | 0000 | 0000 | 0000 | 0000 | 0000 | 0000 | 0000 | 0000 | 3fc5 | 5555 | 5555 | 555a |
| 1653140 | bf81 | 1111 | 1111 | 0d97 | 3f2a | 01a0 | 19e4 | a9ac | bec7 | 1de3 | 7262 | ecf8 | 3e5a | e5f9 | 3356 | 9b98 | bde5 | de23 | ad24 | 95f2 | 0000 | 0000 | 0000 | 0000 |
| 1653220 | 0000 | 0000 | 0000 | 0000 | 3fc5 | 5555 | 5555 | 550c | bf81 | 1111 | 1110 | c461 | 3f2a | 01a0 | 1974 | 6345 | bec7 | 1de3 | 209c | dcd9 | 3e5a | e5c0 | e319 | a4ef |
| 1653300 | bde5 | cf61 | df67 | 2b13 | 0000 | 0000 | 0000 | 0000 | 0000 | 0000 | 0000 | 0000 | 3fe0 | b70c | 6d60 | 4dd5 | 3fd0 | 584c | 2223 | 1902 | 4024 | 0000 | 0000 | 0000 |
| 1653360 | 3ddb | 7cdf | d9d7 | b1bb | 3ff9 | 21fb | 5444 | 2d18 | 3fe9 | 21fb | 5444 | 2d18 | 4212 | a05f | 2000 | 0000 | 0000 | 0000 | 0000 | 0000 | 3fe4 | 5f30 | 6dc9 | c883 |
| 1653440 | 0000 | 0000 | 0000 | 0000 | 0000 | 0000 | 0000 | 0000 | 0000 | 0000 | 0000 | 0000 | 0000 | 0000 | 0000 | 0000 | 3ff0 | 0000 | 0000 | 0000 | 3fe0 | 0000 | 0000 | 0000 |
| 1653520 | 3fe4 | 0000 | 0000 | 0000 | 3fd8 | 0000 | 0000 | 0000 | 3fea | 0000 | 0000 | 0000 | 3fc8 | 0000 | 0000 | 0000 | 4008 | 0000 | 0000 | 0000 | 3f62 | 6634 | 117f | 8445 |
| 1653600 | 3f16 | 4840 | e171 | 9f80 | 3fc5 | 5555 | 5555 | 5555 | 3fd5 | 5555 | 5555 | 5555 | 3fa5 | 5555 | 5555 | 5555 | 3fc1 | 1111 | 1111 | 1111 | 3f81 | 1111 | 1111 | 1111 |
| 1653660 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 |
| 1653740 | 0000 | 0000 | 0000 | 0000 | 0000 | 0000 | 0000 | 0000 | 0000 | 0000 | 0000 | 0000 | 3ff9 | 21fb | 5440 | 0000 | 3dd0 | b461 | 1a60 | 0000 | 3ff9 | 21fb | 5400 | 0000 |
| 1654020 | 3e11 | 0b46 | 0000 | 0000 | 4028 | 2329 | 5f61 | 7267 | 5f72 | 6564 | 2e63 | 2031 | 2e36 | 2038 | 382f | 3032 | 2f30 | 3820 | 534d | 4900 | 3ff9 | 21fb | 5400 | 0000 |
| 1654100 | 3e11 | 0b46 | 1180 | 0000 | 3c23 | 1319 | 8a00 | 0000 | 3a37 | 01b8 | 3980 | 0000 | 3841 | 2902 | 4e00 | 0000 | 3631 | 14cf | 9880 | 0000 | 345a | 0105 | df00 | 0000 |
| 1654160 | 3274 | c762 | 7300 | 0000 | 3ff9 | 21fb | 5400 | 0000 | 3e11 | 0b46 | 1180 | 0000 | 3c23 | 0000 | 0000 | 0000 | 3ff9 | 21fb | 5400 | 0000 | 3e11 | 0b46 | 0000 | 0000 |
| 1654240 | c190 | 0000 | 0000 | 0000 | 3fe4 | 5f30 | 6dc9 | c883 | 3fe0 | 0000 | 0000 | 0000 | 4190 | 0000 | 0000 | 0000 | 0000 | 0000 | 0000 | 0000 | 4028 | 2329 | 5f73 | 6c6f |
| 1654320 | 775f | 6172 | 675f | 7265 | 642e | 6320 | 312e | 3320 | 3839 | 2f30 | 322f | 3038 | 2053 | 4d49 | 0000 | 0000 | 0000 | 0001 | 00a2 | f983 | 006e | 4e44 | 0016 | f3c4 |
| 1654400 | 00ea | 69b5 | 00d3 | e131 | 0060 | e1d2 | 00d7 | 982a | 00c0 | 31f5 | 00d6 | 7bcc | 00fd | 1375 | 0060 | 919b | 003f | a0bb | 0061 | 2abb | 0071 | 4f9b | 0003 | da8a |
| 1654460 | 00c0 | 5948 | 00d0 | 23f4 | 005a | fa37 | 0051 | 631d | 00cd | 7a90 | 00c0 | 474a | 00f6 | a6f3 | 001a | 52e1 | 005c | 3927 | 003a | da45 | 004e | 2db5 | 0064 | e8c4 |
| 1654540 | 0027 | 4a5b | 00b7 | 4adc | 001e | 6591 | 0028 | 22be | 0047 | 71f5 | 0012 | a63f | 0083 | bd35 | 0024 | 88ca | 001f | e1be | 0042 | c21a | 0068 | 2569 | 002a | fb91 |
| 1654620 | 0068 | ade1 | 004a | 42e5 | 009b | e357 | 00b7 | 9675 | 00ce | 998a | 0083 | af8b | 00e6 | 45e6 | 00df | 0789 | 009e | 9747 | 00aa | 15ff | 0035 | 8c3f | 00af | 3141 |
| 1654700 | 0072 | a3f7 | 002b | f1d4 | 00f3 | ad96 | 007d | 759f | 0025 | 7fce | 0029 | fb69 | 00b1 | b42c | 00c3 | 2de1 | 008c | 0bbd | 0031 | ec2f | 0094 | 2026 | 0085 | dce7 |
| 1654760 | 0065 | 3ff3 | 0013 | 6fa7 | 000d | 7a5f | 00a2 | f983 | 006e | 4e44 | 0015 | 2a00 | 0006 | 2bc4 | 000d | a276 | 00be | d4c1 | 00fd | f905 | 005c | d5ba | 0076 | 7cec |
| 1655040 | 001f | 80d6 | 00c2 | 6053 | 003a | 0070 | 0010 | 7c2a | 00f6 | 8ee9 | 0068 | 7b7a | 00b9 | 90aa | 0038 | de4b | 0096 | cff3 | 0092 | 735e | 008b | 34f6 | 0019 | 5bfc |
| 1655120 | 0027 | f88e | 00a9 | 3ec5 | 0039 | 58a5 | 003e | 5d13 | 001c | 55a8 | 005b | 4a8b | 00a4 | 2e04 | 0012 | d105 | 0035 | 580d | 00f6 | 2347 | 0045 | 0900 | 00b9 | 8bca |
| 1655200 | 00f7 | e8a4 | 00a2 | e5d5 | 0069 | bc52 | 00f0 | 381d | 001a | 0a88 | 00fe | 8714 | 007f | 6735 | 00bb | 7d4d | 00c6 | f642 | 00b2 | 7e80 | 0061 | 91bf | 00b6 | b750 |
| 1655260 | 0052 | 776e | 00d6 | 0fd0 | 0060 | 7dcc | 0068 | bfaf | 00ed | 69fc | 006e | b305 | 00d2 | 557d | 0025 | bdfb | 003e | 4aa1 | 0084 | 472d | 008b | 0376 | 00f7 | 7740 |
| 1655340 | 00d2 | 90df | 0015 | ec8c | 0045 | a5c3 | 0061 | 81ef | 00c5 | e7e8 | 00d8 | 909c | 00f6 | 2144 | 0029 | 8428 | 006e | 5d9d | 00a2 | f983 | 006e | 4e44 | 0015 | 29fc |
| 1655420 | 0027 | 57d1 | 00f5 | 34dd | 00c0 | db62 | 0095 | 993c | 0043 | 9041 | 00fe | 5163 | 00ab | debb | 00c5 | 61b7 | 0024 | 6e3a | 0042 | 41d2 | 00e0 | 0649 | 002e | ea09 |
| 1655500 | 00d1 | 921c | 00fe | 1deb | 001c | b129 | 00a7 | 3ee8 | 0082 | 35f5 | 002e | bb44 | 0084 | e99c | 0070 | 26b4 | 005f | 7e41 | 0039 | 91d6 | 0039 | 8353 | 0039 | f49c |
| 1655560 | 0084 | 5f8b | 00bd | f928 | 003b | 1ff8 | 0097 | ffde | 0005 | 980f | 00ef | 2f11 | 008b | 5a0a | 006d | 1f6d | 0036 | 7ecf | 0027 | cb09 | 00b7 | 4f46 | 003f | 669e |
| 1655640 | 005f | ea2d | 0075 | 27ba | 00c7 | ebe5 | 00f1 | 7b3d | 0007 | 39f7 | 008a | 5292 | 00ea | 6bfb | 005f | b11f | 008d | 5d08 | 0056 | 0339 | 0046 | fc7b | 006b | abf0 |
| 1655720 | 00cf | bc20 | 009a | f436 | 001d | a9e3 | 0091 | 615e | 00e6 | 1b08 | 0065 | 9985 | 005f | 14a0 | 0068 | 408d | 00ff | d880 | 004d | 7327 | 0031 | 0606 | 0015 | 56ca |
| 1656000 | 0073 | a8c9 | 0060 | e27b | 00c0 | 4c6b | 0000 | 0000 | 3fe9 | 21fb | 5444 | 2d18 | 4170 | 0000 | 0000 | 0000 | 3e70 | 0000 | 0000 | 0000 | 3ff9 | 21fb | 4000 | 0000 |
| 1656060 | 3e74 | 442d | 0000 | 0000 | 3cf8 | 4698 | 8000 | 0000 | 3cf8 | 4698 | 0000 | 0000 | 3cf8 | 0000 | 0000 | 0000 | 0000 | 0000 | 0000 | 0001 | 0000 | 0000 | 0000 | 0000 |
| 1656140 | 3fc0 | 0000 | 0000 | 0000 | 4020 | 0000 | 0000 | 0000 | 3fe0 | 0000 | 0000 | 0000 | 3ff0 | 0000 | 0000 | 0000 | 4028 | 2329 | 6965 | 6565 | 5f66 | 756e | 632e | 5320 |
| 1656220 | 312e | 3820 | 3838 | 2f30 | 322f | 3038 | 2053 | 4d49 | 0000 | 0000 | 0000 | 0000 | 0000 | 0000 | 0000 | 0000 | 0000 | 0000 | 0000 | 0000 | 4350 | 0000 | 0000 | 0000 |
| 1656300 | 3c90 | 0000 | 0000 | 0000 | 7fe0 | 0000 | 0000 | 0000 | 0010 | 0000 | 0000 | 0000 | 4028 | 2329 | 6879 | 706f | 742e | 6320 | 312e | 3820 | 3838 | 2f30 | 322f | 3038 |
| 1656360 | 2053 | 4d49 | 0000 | 0000 | 0000 | 0000 | 0000 | 0000 | 3fe6 | 2e42 | fefa | 39ef | 3fe6 | 2e42 | fee0 | 0000 | 3dea | 39ef | 3579 | 3c76 | 7fff | ffff | ffff | ffff |
| 1656440 | 7ff0 | 0000 | 0000 | 0001 | 7ff0 | 0000 | 0000 | 0000 | 4330 | 0000 | 0000 | 0000 | 3cb0 | 0000 | 0000 | 0000 | 4009 | 21fb | 5444 | 2d18 | 3ff6 | a09e | 667f | 3bcd |
| 1656520 | 4003 | 504f | 333f | 9de6 | 3ca2 | 1165 | f626 | cdd5 | 7fef | ffff | ffff | ffff | 0000 | 0000 | 0000 | 0001 | 0010 | 0000 | 0000 | 0000 | 000f | ffff | ffff | ffff |
| 1656600 | 4086 | 2e42 | fefa | 39ef | c087 | 4910 | d52d | 3052 | 3ff7 | 1547 | 652b | 82fe | 4350 | 0000 | 0000 | 0000 | 3c90 | 0000 | 0000 | 0000 | 7fd0 | 0000 | 0000 | 0000 |
| 1656660 | 0010 | 0000 | 0000 | 0000 | 0000 | 0000 | 0000 | 0000 | 4028 | 2329 | 7371 | 7274 | 2e53 | 2031 | 2e38 | 2038 | 382f | 3032 | 2f30 | 3820 | 436f | 7079 | 7220 | 3139 |
| 1656740 | 3837 | 2053 | 756e | 204d | 6963 | 726f | 0000 | 0000 | 0000 | 0000 | 0000 | 0000 | 4350 | 0000 | 0000 | 0000 | 3e40 | 0000 | 0000 | 0000 | 3fe0 | 0000 | 0000 | 0000 |
| 1657020 | 3ff0 | 0000 | 0000 | 0000 | 3ff8 | 0000 | 0000 | 0000 | 3fef | ffff | ffff | ffff | 0000 | 0000 | 0000 | 0000 | 0000 | 0000 | 0000 | 0000 | 0000 | 0000 | 0000 | 0000 |
| 1657100 | 0000 | 0000 | 0000 | 0000 | 3c60 | 0000 | 0000 | 0000 | 0000 | 1500 | 0000 | 2ef8 | 0000 | 4d67 | 0000 | 6b02 | 0000 | 87be | 0000 | a395 | 0000 | be7a | 0000 | d866 |
| 1657160 | 0000 | f14a | 0001 | 091b | 0001 | 1fcd | 0001 | 3552 | 0001 | 4999 | 0001 | 5c98 | 0001 | 6e34 | 0001 | 7e5f | 0001 | 8d03 | 0001 | 9a01 | 0001 | a545 | 0001 | ae8a |
| 1657240 | 0001 | b5c4 | 0001 | bb01 | 0001 | bfde | 0001 | c28d | 0001 | c2de | 0001 | c0db | 0001 | ba7e | 0001 | b11c | 0001 | a4b5 | 0001 | 953d | 0001 | 8266 | 0001 | 6be0 |
| 1657320 | 0001 | 683e | 0001 | 79d8 | 0001 | 8a4d | 0001 | 9992 | 0001 | a789 | 0001 | b445 | 0001 | bf61 | 0001 | c989 | 0001 | d16d | 0001 | d77b | 0001 | dddf | 0001 | e2ad |

```
1657400 0001 e5bf 0001 e6e8 0001 e654 0001 e3cd 0001 df2a 0001 d635 0001 cb16 0001 be2c 0001 ae4e 0001 9bde 0001 868e 0001 6e2e
1657460 0001 527f 0001 334a 0001 1051 0000 e951 0000 be01 0000 8e0d 0000 5924 0000 1edd 0000 0000 0000 0000 4028 2329 5356 4944
1657540 5f6c 6962 6d5f 6572 722e 6320 312e 3720 3838 2f30 322f 3038 2053 4d49 0000 0000 0000 0000 0000 0000 3fe6 2e42 fefa 39ef
1657620 3fe6 2e42 fee0 0000 3dea 39ef 3579 3c76 7fff ffff ffff ffff 7ff0 0000 0000 0001 7ff0 0000 0000 0000 4330 0000 0000 0000
1657700 3cb0 0000 0000 0000 4009 21fb 5444 2d18 3ff6 a09e 667f 3bcd 4003 504f 333f 9de6 3ca2 1165 f626 cdd5 7fef ffff ffff ffff
1657760 0000 0000 0000 0001 0010 0000 0000 0000 000f ffff ffff ffff 4086 2e42 fefa 39ef c087 4910 d52d 3052 3ff7 1547 652b 82fe
1660040 3ff0 0000 0000 0000 bff0 0000 0000 0000 0000 0000 0000 0000 3fe0 0000 0000 0000 4000 0000 0000 0000 0000 0000 0000 0000
1660120 6163 6f73 0061 636f 733a 2044 4f4d 4149 4e20 6572 726f 720a 0061 7369 6e00 6173 696e 3a20 444f 4d41 494e 2065 7272 6f72
1660200 0a00 6174 616e 3200 6174 616e 323a 2044 4f4d 4149 4e20 6572 726f 720a 0068 7970 6f74 0063 6f73 6800 6578 7000 6578 7000
1660260 7930 0079 303a 2053 494e 4720 6572 726f 720a 0079 3000 7930 3a20 444f 4d41 494e 2065 7272 6f72 0a00 7931 0079 313a 2053
1660340 494e 4720 6572 726f 720a 0079 3100 7931 3a20 444f 4d41 494e 2065 7272 6f72 0a00 796e 0079 6e3a 2053 494e 4720 6572 726f
1660420 720a 0079 6e00 796e 3a20 444f 4d41 494e 2065 7272 6f72 0a00 6761 6d6d 6100 6761 6d6d 6100 6761 6d6d 613a 2053 494e 4720
1660500 6572 726f 720a 006c 6f67 006c 6f67 3a20 5349 4e47 2065 7272 6f72 0a00 6c6f 6700 6c6f 673a 2044 4f4d 4149 4e20 6572 726f
1660560 720a 006c 6f67 3130 006c 6f67 3130 3a20 5349 4e47 2065 7272 6f72 0a00 6c6f 6731 3000 6c6f 6731 303a 2044 4f4d 4149 4e20
1660640 6572 726f 720a 0070 6f77 0070 6f77 2830 2c30 293a 2044 4f4d 4149 4e20 6572 726f 720a 0070 6f77 0070 6f77 0070 6f77 0070
1660720 6f77 2830 2c6e 6567 293a 2053 494e 4720 6572 726f 720a 0070 6f77 006e 6567 2a2a 6e6f 6e2d 696e 7465 6772 616c 3a20 444f
1661000 4d41 494e 2065 7272 6f72 0a00 7369 6e68 0073 7172 7400 7371 7274 3a20 444f 4d41 494e 2065 7272 6f72 0a00 0000 0000 0000
1661060 4028 2329 6d61 7468 6572 722e 6320 312e 3220 3838 2f30 322f 3038 2053 4d49 0000 4028 2329 7269 6e74 2e53 2031 2e36 2038
1661140 382f 3032 2f30 3820 534d 4900 0000 0000 0000 0000 0000 0000 0000 0000 0000 0000 4330 0000 0000 0000 3fe0 0000 0000 0000
1661220 0000 0000 0000 0000 0000 0000 0000 0000 0000 0000 0000 0000 4028 2329 6d75 6c74 6970 6c79 2e73 2031 2e31 3120 3838 2f30
1661300 322f 3038 2043 6f70 7972 2031 3938 3720 5375 6e20 4d69 6372 6f00 0000 0000 0000 0000 0000 0000 0000 0000 0000 0000 0000
1661360 0000 0000 0000 0000 0000 0000 0000 0000 0000 0000 0000 0000 0000 0000 0000 0000 0000 0000 0000 0000 0000 0000 0000 0000
*
1661520 0000 0000 0000 0000 0000 0000 0000 0000 0000 0000 0000 0000 0000 0000 0000 0000 0000 4b9f b328 0007 000e 8708 0000 0000
1661600 0000 2727 b328 0007 000e 8734 0000 0000 0000 4ba7 b328 3639 000d 18bc 0000 0000 0000 4baf b328 2a87 000e 87e0 0000 0000
1661660 0000 4bb7 b328 0df7 000b 308c 0000 0000 000f 4c40 0000 0000 0000 4bd7 b328 2a87 000b 30b8 0000 0000 0000 4bbf b328 0df7
1661740 000b 30e4 0000 0000 0000 4bc7 b328 4c30 000b 3110 0000 0000 0000 4bdf b328 00bb 000b 313c 0000 0000 0000 4be7 b328 2a99
1662020 000b 3168 0000 0000 0000 4bef b328 4c89 000b 3194 0000 0000 0000 4bf7 b328 4ca5 000b 31c0 0000 0000 0000 4bff b328 2a87
1662100 000b 31ec 0000 0000 0000 4c07 b328 0df7 000b 3218 0000 0000 0000 4c0f b328 4ca0 000b 3244 0000 0000 0000 4c2f b328 4d02
1662160 000b 3270 0000 0000 0000 4c4f b328 4d12 000b 329c 0000 0000 0000 4c17 b328 4d22 000b 32c8 0000 0000 0000 4c37 b328 00c3
1662240 000e 8760 0000 0000 0000 4c57 b328 2b1d 000e 878c 0000 0000 0000 4c6f b328 4d29 000b 33f4 0000 0000 0000 4c1f b328 4d45
1662320 000b 3420 0000 0000 0000 4c3f b328 2a87 000b 344c 0000 0000 0000 4c5f b328 0df7 000b 3478 0000 0000 0000 4c27 b328 4d40
1662400 000b 34a4 0000 0000 0000 4c47 b328 4da2 000b 34d0 0000 0000 0000 4c67 b328 4db2 000b 34fc 0000 0000 0000 4d07 b328 00cb
1662460 000b 3528 0000 0000 0000 4d7f b328 2ba1 000b 3554 0000 0000 0000 4cff b328 4db9 000b 3580 0000 0000 0000 4d17 b328 4dd5
1662540 000b 35ac 0000 0000 0000 4d27 b328 2a87 000b 35d8 0000 0000 0000 4d37 b328 0df7 000b 3604 0000 0000 0000 4d3f b328 4dd0
1662620 000b 3630 0000 0000 0015 3148 000f 4e58 000f 4488 0000 0000 0000 4d2f b328 2c25 000b 365c 0000 0000 0000 4d47 b328 4e29
1662700 000b 3688 0000 0000 000f 4c20 0000 0000 0000 444f b328 4e3c 000b 36b4 0000 0000 0000 4d87 b328 36dd 000b 36e0 0000 0000
1662760 000f 4d58 0000 0000 0015 3128 000f 4e80 2c78 001a 0002 438a 7ae4 0000 8258 7c28 000e e2a8 0008 8a34 228c 2d41 2c78 001a
1663040 0002 438a 7ae4 0000 8258 7c28 000e d488 0008 8a34 228c 4eca 2c78 001a 0002 438a 7ae4 0000 8258 7c28 000e c368 0008 8a34
1663120 228c 2f0d 2c78 001e 0002 438a 7ae4 0000 8264 8258 7ebc 0000 000e 98a4 0010 8a6c 228c 3015 2c78 001a 0002 438a 7ae4 0000
1663200 8258 7c28 000f 0998 0008 8a34 228c 4f22 2c78 001a 0002 438a 7ae4 0000 8258 7c28 000e 95b0 0008 8a34 228c 2cbd 2c78 001a
1663260 0002 438a 7ae4 0000 8258 7c28 000e c340 0008 8a34 228c 0007 2c78 001e 0002 438a 7ae4 0000 8264 8258 7ebc 0000 000f 03c0
1663340 0010 8a6c 228c 4f7a 2c78 001a 0002 438a 7ae4 0000 8258 7c28 000e aa28 0008 8a34 228c 2cfd 2c78 001a 0002 438a 7ae4 0000
1663420 8258 7c28 000e b074 0008 8a34 228c 00db 2c78 001e 0002 438a 7ae4 0000 8264 8124 7ebc 0000 000e b7a8 000c 8a6c 228c 4fa9
1663500 2c78 001a 0002 438a 7ae4 0000 8258 7c28 000e ac54 0008 8a34 228c 4fd5 2c78 001a 0002 438a 7ae4 0000 8258 7c28 000e b354
1663560 0008 8a34 228c 4fed 2c78 001e 0002 438a 7ae4 0000 8264 8124 7ebc 0000 000e bafc 000c 8a6c 228c 3740 2c78 001a 0002 438a
1663640 7ae4 0000 8258 7c28 000e e568 0008 8a34 228c 11b8 2c78 001a 0002 438a 7ae4 0000 8258 7c28 000e e570 0008 8a34 228c 2a87
1663720 2c78 001a 0002 438a 7ae4 0000 8258 7c28 000e e578 0008 8a34 228c 0ad7 2c78 001a 0002 438a 7ae4 0000 8258 7c28 000e a800
1664000 0008 8a34 228c 0007 2c78 001a 0002 438a 7ae4 0000 8258 7c28 000e a668 0008 8a34 228c 2f0d 2c78 001a 0002 438a 7ae4 0000
1664060 8258 7c28 000e d0d8 0008 8a34 228c 2db1 2c78 001e 0002 438a 7ae4 0000 8264 8258 7ebc 0000 000e cbc4 0010 8a6c 228c 50d5
1664140 2c78 001a 0002 438a 7ae4 0000 8258 7c28 000e d940 0008 8a34 228c 1284 2c78 001a 0002 438a 7ae4 0000 8258 7c28 000e d710
1664220 0008 8a34 228c 23ff 2c78 001a 0002 438a 7ae4 0000 8258 7c28 000e c928 0008 8a34 228c 2f0d 2c78 001a 0002 438a 7ae4 0000
1664300 8258 7c28 000e 88dc 0008 8a34 228c 2e35 2c78 001a 0002 438a 7ae4 0000 8258 7c28 000e 8b00 0008 8a34 228c 5158 2c78 001a
1664360 0002 438a 7ae4 0000 8258 7c28 000e 8c00 0008 8a34 228c 378d 2c78 001e 0002 438a 7ae4 0000 8130 8258 7ebc 0000 000e 8800
1664440 000c 8a6c 228c 23ff 2c78 001e 0002 438a 7ae4 0000 8130 8258 7ebc 0000 000e 96e8 000c 8a6c 228c 2a87 2c78 001e 0002 438a
```

```
1664520 7ae4 0000 8264 8258 7ebc 0000 000e ff68 0010 8a6c 228c 51cc 2c78 0020 0002 438a 7ae4 0004 7ed4 8264 8124 7c28 000e 9214
1664600 0010 8908 88e4 228c 2c78 001e 0002 438a 7ae4 0000 8264 8124 7ebc 0000 000e 8dd8 000c 8a6c 228c 523a 2c78 0024 0002 438a
1664660 7ae4 0008 7ed4 7ed4 8264 8124 7ebc 0000 000e 8e98 0014 8a80 8ab8 228c 2c78 0026 0002 438a 7ae4 0004 827c 8270 7ed4 8124
1664740 7ebc 0000 000e 8f90 0018 8924 0018 8a48 228c 2f91 2c78 0026 0002 438a 7ae4 000c 7ed4 7ed4 7ed4 8258 7ebc 0000 000e 9450
1665020 0014 88c8 8a90 8900 228c 3227 2c78 0026 0002 438a 7ae4 0004 8148 8270 8130 7ed4 7ebc 0000 000e 94b4 0014 8924 0018 8a10
1665100 228c Cad7 2c78 001e 0002 438a 7ae4 0000 8264 8258 7ebc 0000 000e 8da0 0010 8a6c 228c 1415 000e 86c8 0000 0010 000f 61fc
1665160 0000 0008 2aa8 9a04 000f 9a00 0010 8d78 2b24 9b48 0002 438a 000f 68da 000f 88b4 000e 6e08 0200 4b9f 0000 3287 0000 0008
1665240 000e 6df8 000e 6df8 0041 0000 0000 0000 000e 75b0 0200 2727 0000 3287 0000 0008 000f 5360 000f 5360 0041 0000 0000 0000
1665320 2c78 0010 0002 438a 239c 0000 000e 75c0 000e 75d0 0200 4ba7 0000 3287 0000 0008 000f 5390 000f 5390 0041 0000 0000 0000
1665400 2c78 0010 0002 438a 239c 0000 000e 75e0 000e 75f0 0300 4baf 0000 3287 0000 000c 000f 53c0 000f 53c0 0041 0000 0000 0000
1665460 2c78 0010 0002 438a 239c 0000 000e 7600 000e 7630 0200 4bb7 0000 3287 0000 0008 000f 53f0 000f 53f0 0041 0000 0000 0000
1665540 2c78 0010 0002 438a 239c 0000 000e 7640 000e 7660 0200 4bbf 0000 3287 0000 0008 000f 5420 000f 5420 0041 0000 0000 0000
1665620 2c78 0010 0002 438a 239c 0000 000e 7670 000e 7690 0300 4bc7 0000 3287 0000 000c 000f 5450 000f 5450 0041 0000 0000 0000
1665700 2c78 0010 0002 438a 239c 0000 000e 76a0 000e 76c0 0200 4bcf 0000 3287 0000 0008 000f 5480 000f 5480 0041 0000 0000 0000
1665760 2c78 0010 0002 438a 239c 0000 000e 76d0 000e 7700 0200 4bd7 0000 3287 0000 0008 000f 54b0 000f 54b0 0041 0000 0000 0000
1666040 2c78 0010 0002 438a 239c 0000 000e 7710 000e 7730 0200 4bdf 0000 3287 0000 0008 000f 54e0 000f 54e0 0041 0000 0000 0000
1666120 2c78 0010 0002 438a 239c 0000 000e 7740 000e 7770 0200 4be7 0000 3287 0000 0008 000f 5510 000f 5510 0041 0000 0000 0000
1666200 2c78 0010 0002 438a 239c 0000 000e 7780 000e 77a0 0300 4bef 0000 3287 0000 000c 000f 5540 000f 5540 0041 0000 0000 0000
1666260 2c78 0010 0002 438a 239c 0000 000e 77b0 000e 77d0 0200 4bf7 0000 3287 0000 0008 000f 5570 000f 5570 0041 0000 0000 0000
1666340 2c78 0010 0002 438a 239c 0000 000e 77e0 000e 7800 0200 4bff 0000 3287 0000 0008 000f 55a0 000f 55a0 0041 0000 0000 0000
1666420 2c78 0010 0002 438a 239c 0000 000e 7810 000e 7840 0300 4c07 0000 3287 0000 000c 000f 55d0 000f 55d0 0041 0000 0000 0000
1666500 2c78 0010 0002 438a 239c 0000 000e 7850 000e 7880 0200 4c0f 0000 3287 0000 0008 000f 5600 000f 5600 0041 0000 0000 0000
1666560 2c78 0010 0002 438a 239c 0000 000e 7890 000e 78c0 0200 4c17 0000 3287 0000 0008 000f 5630 000f 5630 0041 0000 0000 0000
1666640 2c78 0010 0002 438a 239c 0000 000e 78d0 000e 78f0 0200 4c1f 0000 3287 0000 0008 000f 5660 000f 5660 0041 0000 0000 0000
1666720 2c78 0010 0002 438a 239c 0000 000e 7900 000e 7930 0200 4c27 0000 3287 0000 0008 000f 5690 000f 5690 0041 0000 0000 0000
1667000 2c78 0010 0002 438a 239c 0000 000e 7940 000e 7970 0200 4c2f 0000 3287 0000 0008 000f 56c0 000f 56c0 0041 0000 0000 0000
1667060 2c78 0010 0002 438a 239c 0000 000e 7980 000e 79a0 0200 4c37 0000 3287 0000 0008 000f 56f0 000f 56f0 0041 0000 0000 0000
1667140 2c78 0010 0002 438a 239c 0000 000e 79b0 000e 79d8 0200 4c3f 0000 3287 0000 0008 000f 5720 000f 5720 0041 0000 0000 0000
1667220 2c78 0010 0002 438a 239c 0000 000e 79e8 000e 7a10 0200 4c47 0000 3287 0000 0008 000f 5750 000f 5750 0041 0000 0000 0000
1667300 2c78 0010 0002 438a 239c 0000 000e 7a20 000e 7a48 0200 4c4f 0000 3287 0000 0008 000f 5780 000f 5780 0041 0000 0000 0000
1667360 2c78 0010 0002 438a 239c 0000 000e 7a58 000e 7a88 0200 4c57 0000 3287 0000 0008 000f 57b0 000f 57b0 0041 0000 0000 0000
1667440 2c78 0010 0002 438a 239c 0000 000e 7a98 000e 7ac8 0200 4c5f 0000 3287 0000 0008 000f 57e0 000f 57e0 0041 0000 0000 0000
1667520 2c78 0010 0002 438a 239c 0000 000e 7ad8 000e 7b08 0200 4c67 0000 3287 0000 0008 000f 5810 000f 5810 0041 0000 0000 0000
1667600 2c78 0010 0002 438a 239c 0000 000e 7b18 000e 7b48 0300 4c6f 0000 3287 0000 000c 000f 5840 000f 5840 0041 0000 0000 0000
1667660 2c78 0010 0002 438a 239c 0000 000e 7b58 000e 7b78 0300 4c77 0000 3287 0000 000c 000f 5870 000f 5870 0041 0000 0000 0000
1667740 2c78 0010 0002 438a 239c 0000 000e 7b88 000e 7ba8 0300 4c7f 0000 3287 0000 000c 000f 58a0 000f 58a0 0041 0000 0000 0000
1670020 2c78 0010 0002 438a 239c 0000 000e 7bb8 000e 7c28 0200 4c87 0000 3207 0000 0008 000f 58d0 000f 58d0 0041 0000 0000 0000
1670100 2c78 0010 0002 438a 239c 0000 000e 7bf8 000f 58b0 0300 4c87 0000 3287 0000 000c 000f 5900 000f 5900 0041 0000 0000 0000
1670160 2c78 0010 0002 438a 239c 0000 000e 7c38 000e 7c48 0300 4c8f 0000 3287 0000 000c 000f 5930 000f 5930 0041 0000 0000 0000
1670240 2c78 0010 0002 438a 239c 0000 000e 7c58 000e 7c78 0400 4c97 0000 3287 0000 0010 000f 5960 000f 5960 0041 0000 0000 0000
1670320 2c78 0010 0002 438a 239c 0000 000e 7c88 000e 7ce8 0200 4c9f 0000 3287 0000 0008 000f 5990 000f 5990 0041 0000 0000 0000
1670400 2c78 0010 0002 438a 239c 0000 000e 7cb8 000f 5970 0300 4c9f 0000 3287 0000 000c 000f 59c0 000f 59c0 0041 0000 0000 0000
1670460 2c78 0010 0002 438a 239c 0000 000e 7cf8 000e 7d38 0200 4ca7 0000 3287 0000 0008 000f 59f0 000f 59f0 0041 0000 0000 0000
1670540 2c78 0010 0002 438a 239c 0000 000e 7d18 000f 59d0 0300 4ca7 0000 3287 0000 000c 000f 5a20 000f 5a20 0041 0000 0000 0000
1670620 2c78 0010 0002 438a 239c 0000 000e 7d48 000e 7d88 0200 4caf 0000 3287 0000 0008 000f 5a50 000f 5a50 0041 0000 0000 0000
1670700 2c78 0010 0002 438a 239c 0000 000e 7d68 000f 5a30 0300 4caf 0000 3287 0000 000c 000f 5a80 000f 5a80 0041 0000 0000 0000
1670760 2c78 0010 0002 438a 239c 0000 000e 7d98 000e 7dd8 0200 4cb7 0000 3287 0000 0008 000f 5ab0 000f 5ab0 0041 0000 0000 0000
1671040 2c78 0010 0002 438a 239c 0000 000e 7db8 000f 5a90 0300 4cb7 0000 3287 0000 000c 000f 5ae0 000f 5ae0 0041 0000 0000 0000
1671120 2c78 0010 0002 438a 239c 0000 000e 7de8 000e 7e28 0200 4cbf 0000 3287 0000 0008 000f 5b10 000f 5b10 0041 0000 0000 0000
1671200 2c78 0010 0002 438a 239c 0000 000e 7e08 000f 5af0 0300 4cbf 0000 3287 0000 000c 000f 5b40 000f 5b40 0041 0000 0000 0000
1671260 2c78 0010 0002 438a 239c 0000 000e 7e38 000e 7e78 0200 4cc7 0000 3287 0000 0008 000f 5b70 000f 5b70 0041 0000 0000 0000
1671340 2c78 0010 0002 438a 239c 0000 000e 7e58 000f 5b50 0300 4cc7 0000 3287 0000 000c 000f 5ba0 000f 5ba0 0041 0000 0000 0000
1671420 2c78 0010 0002 438a 239c 0000 000e 7e88 000e 7ed8 0200 4ccf 0000 3287 0000 0008 000f 5bd0 000f 5bd0 0041 0000 0000 0000
1671500 2c78 0010 0002 438a 239c 0000 000e 7ea8 000f 5bb0 0300 4ccf 0000 3287 0000 000c 000f 5c00 000f 5c00 0041 0000 0000 0000
1671560 2c78 0010 0002 438a 239c 0000 000e 7ee8 000e 7f34 0200 4cd7 0000 3287 0000 0008 000f 5c30 000f 5c30 0041 0000 0000 0000
```

```
1671640  2c78 0010 0002 438a 239c 0000 000e 7f14 000f 5c10 0300 4cd7 0000 3287 0000 000c 000f 5c60 000f 5c60 0041 0000 0000 0000
1671720  2c78 0010 0002 438a 239c 0000 000e 7f44 000e 7f60 0300 4cdf 0000 3287 0000 000c 000f 5c90 000f 5c90 0041 0000 0000 0000
1672000  2c78 0010 0002 438a 239c 0000 000e 7f7c 000e 7fa0 0200 4ce7 0000 3287 0000 0008 000f 5cc0 000f 5cc0 0041 0000 0000 0000
1672060  2c78 0010 0002 438a 239c 0000 000e 7fb0 000e 7fd0 0200 4cef 0000 3287 0000 0008 000f 5cf0 000f 5cf0 0041 0000 0000 0000
1672140  2c78 0010 0002 438a 239c 0000 000e 7fe0 0007 6c69 7465 7261 6c00 0000 0008 7373 6c65 6e67 7468 0000 2954 000c 0002 438a
1672220  49c8 228c 2b24 9ae8 0002 438a 000f c7ea 0006 6d73 742e 706c 0000 0000 0007 735f 726f 6f74 7300 0000 0007 735f 665f 736f
1672300  6e00 0000 b464 5dc4 000c f2d8 000f d73c 0007 7374 725f 6c69 7400 99f4 0009 7365 7061 7261 746f 7200 b464 83d8 000c fc4c
1672360  0000 0000 b464 5d7c 000c fc18 000f 5d78 b464 83f4 000c fa44 0000 0000 2aa8 7474 000f 99c0 0010 8956 0009 6973 5f6f 7264
1672440  7365 7400 0009 6f72 645f 756e 696f 6e00 0006 6663 6f75 6e74 000f 9a24 0008 7761 7273 6861 6c6c 00d8 0009 7265 6163 6861
1672520  626c 6500 0007 636f 6d70 6f73 6500 5df0 0008 735f 6d65 6d62 6572 00fc 0008 705f 6d65 6d62 6572 0008 0008 735f 6c65 6e67
1672600  7468 0014 0008 705f 6c65 6e67 7468 0020 0006 6772 6170 6873 000f 5e2c 0007 6d61 7468 2e70 6c00 5e38 0008 dccc 0200 4e07
1672660  0000 4db7 0000 0008 000f c8ec 000f c8ec 0001 005a 0000 0000 0008 dcec 0200 4e0f 0000 4db7 0000 0008 000f c9e4 000f c9e4
1672740  0001 005a 0000 0000 0008 dd0c 0200 4e17 0000 4db7 0000 0008 000f d0a8 000f d0a8 0001 005a 0000 0000 000a e2fc 0200 4e1f
1673020  0000 4db7 0000 0008 000f 6464 000f 6464 0001 005a 0000 0000 0008 ddac 0200 4e27 0000 4db7 0000 0008 000f 7678 000f 7678
1673100  0001 005a 0000 0000 000e 80c8 000e 75a8 0008 de2c 0200 4e2f 0000 4db7 0000 0008 000f bec0 000f bec0 0001 005a 0000 0000
1673160  000e 8090 000a 36ec 0008 de6c 0200 4e37 0000 4db7 0000 0008 000f bf80 000f bf80 0001 005a 0000 0000 000a 43f8 0000 0000
1673240  000e 804c 000f 5f28 0008 de8c 0200 4e3f 0000 4db7 0000 0008 000f c214 000f c214 0001 005a 0000 0000 0000 4e3f b328 0ad7
1673320  000c f49c 0000 0000 0008 deac 0200 4e47 0000 4db7 0000 0008 000f c2ec 000f c2ec 0001 005a 0000 0000 0000 4e47 b328 13e1
1673400  000c f4d0 0000 0000 000a 4408 0000 0000 000f 5f88 000f 5f98 0008 decc 0300 4e4f 0000 4db7 0000 000c 000f 6c30 000f 6c30
1673460  0001 005a 0000 0000 0000 4e4f b328 5fd5 000c f504 0000 0000 0008 df4c 0300 4e57 0000 4db7 0000 000c 000f 6d2c 000f 6d2c
1673540  0001 005a 0000 0000 0000 4e57 b328 0ad7 000c f538 0000 0000 000f 5ff8 000a 36a4 0008 df6c 0200 4e5f 0000 4db7 0000 0008
1673620  000f c0ec 000f c0ec 0001 005a 0000 0000 0000 4e5f b328 601e 000c f56c 0000 0000 000f 6030 000a 3470 0008 dfec 0200 4e67
1673700  0000 4db7 0000 0008 000f c114 000f c114 0001 005a 0000 0000 0000 4e67 b328 6075 000c f5a0 0000 0000 000f 6068 000a 3504
1673760  0008 e06c 0300 4e6f 0000 4db7 0000 000c 000f 6dc0 000f 6dc0 0001 005a 0000 0000 0000 4e6f b328 15b9 000c f5d4 0000 0000
1674040  000f 60a0 000a 3718 0008 e0ec 0300 4e77 0000 4db7 0000 000c 000f d0d8 000f d0d8 0001 005a 0000 0000 0000 4e77 b328 316d
1674120  000c f608 0000 0000 000a 36c8 0000 0000 000f 60d8 000f 60e8 000b 6720 0200 4e7f 0000 4db7 0000 0008 000f 703c 000f 703c
1674200  0001 005a 0000 0000 0000 4e7f b328 16b1 000c f63c 0000 0000 000f 6118 000b 6748 000c 0260 0200 4e87 0000 4db7 0000 0008
1674260  000f bcd0 000f bcd0 0001 005a 0000 0000 0000 4e87 b328 3231 000c f670 0000 0000 0005 696e 6f75 7400 0003 7573 6500 0000
1674340  000c 4bfc 0200 4e8f 0000 4db7 0000 0008 000f bc88 000f bc88 0001 005a 0000 0000 0000 4e8f b328 2acf 000c f6a4 0000 0000
1674420  0010 b2bc 000a 31b8 0004 7479 7065 0000 000c 63b4 0200 4e97 0000 4db7 0000 0008 000f c02c 000f c02c 0001 005a 0000 0000
1674500  0000 4e97 b328 2acf 000c f6d8 0000 0000 000f 61d0 000c 0e50 000c 6f72 645f 7375 6274 7261 6374 0013 000f 6324 0000 0058
1674560  b288 b66c 0000 05f4 7fff ffff 000f 9bcc 0200 0db5 0100 15ad 0100 33fd 0000 000b 0000 315f 000f 6324 0000 002c b288 b66c
1674640  0000 05f4 7fff ffff 000f 6200 0200 0db5 0100 15ad 0100 33fd 0000 000b 0000 315f 0000 0034 000d f930 b27c b66c 0000 05f5
1674720  7fff ffff 000f 628c 0200 0db5 0400 24ad 0000 4ea7 0000 001b 0000 4db7 0000 4e9f 0000 315f 0000 0034 000f 6258 b27c b66c
1675000  0000 05f6 7fff ffff 000f 62c0 0200 0db5 0400 24ad 0000 4eaf 0000 001b 0000 4db7 0000 4e9f 0000 315f 0000 0034 000f 628c
1675060  b27c b66c 0000 05f7 7fff ffff 000f 62f4 0200 0db5 0400 24ad 0000 3ad7 0000 0013 0000 4db7 0000 3a8f 0000 315f 0000 0034
1675140  000f 62c0 b27c b66c 0000 05f8 7fff ffff 000d aa58 0200 0db5 0400 24ad 0000 3adf 0000 0013 0000 4db7 0000 3a8f 0000 315f
1675220  000f 6498 0000 0144 b27c b66c 0000 05f9 0000 0639 000f 638c 0200 0db5 0500 1cdd 0000 2def 0000 000b 0000 4db7 007d dfe3
1675300  0000 02d3 0000 315f 000f 6388 0000 002c b4f0 b4e4 0000 05f8 7fff ffff 0008 b0dd 0000 0000 0000 0000 000f 7c20 0002 438a
1675360  000f d7c0 000f 63c0 0000 0038 b27c b66c 0000 05fb 0000 063a 000f 63c4 0200 0db5 0500 1cdd 0000 4e8f 0000 0013 0000 4db7
1675440  007b 0c03 0000 02d3 0000 315f 000f 63f8 0000 0038 b27c b66c 0000 05fc 0000 063b 000f 63fc 0200 0db5 0500 1cdd 0000 4e87
1675520  0000 0013 0000 4db7 007b 0a03 0000 02d3 0000 315f 000f 6430 0000 0038 b27c b66c 0000 05fd 0000 063c 000f 6434 0200 0db5
1675600  0500 1cdd 0000 4fd7 0000 0013 0000 4db7 007d e803 0000 02d3 0000 315f 000f 6498 0000 0038 b27c b66c 0000 05fe 0000 063d
1675660  000f 649c 0200 0db5 0500 1cdd 0000 4e1f 0000 0013 0000 4db7 007a f543 0000 02d3 0000 315f 2c78 0030 0002 438a 2520 4700
1675740  332c 247c 0008 e2bc 0018 3310 3ba0 0000 000f 6140 0018 386c 3d30 3cf4 242c 0000 000f bda4 000f 6500 0000 0038 b27c b66c
1676020  0000 05ff 0000 063e 000f 6504 0200 0db5 0500 1cdd 0000 4f8f 0000 001b 0000 4db7 007d ed23 0000 02d3 0000 315f 2954 0030
1676100  0002 438a 56f8 67ec 001c 682c 3574 34e0 0018 3468 3614 001c 24d0 0000 000f be00 0018 3d6c 3d30 2340 000f bda4 000f 6584
1676160  0000 0038 b27c b66c 0000 0600 0000 063f 000f 6588 0200 0db5 0500 1cdd 0000 4f8f 0000 002b 0000 4db7 007d f003 0000 02d3
1676240  0000 315f 2938 004c 000f be58 56f8 6580 001c 5ec0 0000 001c 0200 0ad7 66c0 001c 0020 4938 001c 57b8 6304 5bc4 0200 0ad7
1676320  6c84 001c 55f0 6c04 0020 6784 49b8 36dc 0018 3050 3614 001c 239c 0000 000f be20 000f 65f4 0000 0038 b27c b66c 0000 0601
1676400  0000 0640 000f 65f8 0200 0db5 0500 1cdd 0000 4f8f 0000 0023 0000 4db7 007d f103 0000 02d3 0000 315f 2938 0038 000f 8ad0
1676460  56f8 6580 0018 5ec0 0000 0018 0200 0ad7 66c0 0018 001c 4938 0018 57b8 6c84 001c 6784 3050 3614 0018 239c 0000 000f be20
1676540  000f 6660 0000 0038 b27c b66c 0000 0602 0000 0641 000f 6664 0200 0db5 0500 1cdd 0000 4e2f 0000 0013 0000 4db7 007a f783
1676620  0000 02d3 0000 315f 2954 0034 0002 438a 56f8 671c 682c 5aec 0200 0ad7 6580 0018 3640 344c 3614 0018 24d0 0000 000f bef8
1676700  0014 3d30 2420 0000 000f 5ef0 000f 6704 0000 0070 b27c b66c 0000 0603 0000 0642 000f 669c 0200 0db5 0500 1cdd 0000 4e2f
```

```
1676760  0000 0023 0000 4db7 007d f7c3 0000 02d3 0000 315f 000f 6704 0000 0038 b27c b66c 0000 0604 0000 0643 000f 6708 0200 0db5
1677040  0500 1cdd 0000 4e37 0000 0013 0000 4db7 007a f8c3 0000 02d3 0000 315f 2954 0034 0002 438a 56f8 671c 682c 5aec 0200 0ad7
1677120  6580 0018 3640 344c 3614 0018 24d0 0000 000f bfb8 0014 3d30 2420 0000 000f 5f18 000f 6844 0000 00e8 b27c b66c 0000 0605
1677200  0000 0644 000f 6740 0200 0db5 0500 1cdd 0000 4e37 0000 0023 0000 4db7 007d fdc3 0000 02d3 0000 315f 000f 6774 0000 0038
1677260  b27c b66c 0000 0606 0000 0645 000f 67b8 0200 0db5 0500 1cdd 0000 4e97 0000 0013 0000 4db7 007b 0e03 0000 02d3 0000 315f
1677340  000f 67b4 0000 0040 000f bea5 000f 8b08 0000 0000 000f 89ac 000f 8898 000f c204 000f c2dc 000f c44c 000f 8c6c 000f c3c1
1677420  000f 86b4 000f 90d8 0000 0000 0000 0000 000f 6844 0000 0038 b27c b66c 0000 0607 0000 0646 000f 6848 0200 0db5 0500 1cdd
1677500  0000 4e97 0000 001b 0000 4db7 007d ec23 0000 02d3 0000 315f 2954 0058 0002 438a 56f8 671c 682c 5aec 0200 0ad7 6af0 001c
1677560  5fa0 4714 4768 3818 447c 0000 0200 0ad7 6e58 001c 6af0 0020 24d0 0000 000b 88c8 0024 344c 3894 0020 382c 001c 3c48 0000
1677640  000f c08c 0018 386c 3d30 2340 000f bd84 000f 6910 0000 0038 b27c b66c 0000 0608 0000 0647 000f 6914 0200 0db5 0500 1cdd
1677720  0000 4e97 0000 0023 0000 4db7 007e 0463 0000 02d3 0000 315f 28c4 0058 000f 68d0 56f8 671c 682c 5aec 0200 0ad7 671c 6af0
1700000  001c 46ec 4768 5818 6750 6aa0 5d7c 0000 0200 0ad7 6b74 6af0 0020 382c 001c 39f8 000b 88c8 0024 2ecc 3894 0020 3804 3c9c
1700060  0000 001c 000f 8608 001c 2304 000f c08c 2954 003c 0002 438a 56f8 6580 0018 5ec0 0000 0018 0200 0ad7 66c0 001c 0018 5818
1700140  6670 0020 5c9c 0020 0200 0ad7 6c84 001c 6c94 0018 239c 0000 000f c08c 000f 6978 0000 0038 b27c b66c 0000 0609 0000 0648
1700220  000f 697c 0200 0db5 0500 1cdd 0000 4e5f 0000 0013 0000 4db7 007b 0103 0000 02d3 0000 315f 2954 0030 0002 438a 56f8 62c0
1700300  5de8 0000 0200 0ad7 638c 5758 65d0 0018 5c9c 0018 0200 0ad7 6c34 6bf4 239c 0000 000f 6020 000f 6a34 0000 0070 b27c b66c
1700360  0000 060a 0000 0649 000f 69b4 0200 0db5 0500 1cdd 0000 4e67 0000 0013 0000 4db7 007b 02c3 0000 02d3 0000 315f 000f 6a34
1700440  0000 0038 b27c b66c 0000 060b 0000 064a 000f 6a38 0200 0db5 0500 1cdd 0000 4e67 0000 0023 0000 4db7 007e 09c3 0000 02d3
1700520  0000 315f 2954 004c 0002 438a 56f8 6580 0018 5ec0 0000 0018 0200 0ad7 6854 6a00 5758 65d0 0018 5ec0 0000 0018 0200 0ad7
1700600  6dc4 5370 47e4 3430 24d0 0000 000f c138 001c 38e8 386c 37f0 3cf4 234c 000f c198 000f 6ab4 0000 0038 b27c b66c 0000 060c
1700660  0000 064b 000f 6ab8 0200 0db5 0500 1cdd 0000 4f97 0000 0023 0000 4db7 007e 0cc3 0000 02d3 0000 315f 28c4 0048 000f c1e8
1700740  56f8 6580 0018 5ec0 0000 0018 0200 0ad7 66c0 001c 0018 5758 6c84 001c 6750 5818 6670 0020 5c9c 0020 0200 0ad7 6c84 001c
1701020  55f0 6bc8 6c84 0018 3050 22bc 000f c198 000f 6bc4 0000 00e0 b27c b66c 0000 060d 0000 064c 000f 6af0 0200 0db5 0500 1cdd
1701100  0000 4e3f 0000 0013 0000 4db7 007a fa43 0000 02d3 0000 315f 000f 6b24 0000 0038 b27c b66c 0000 060e 0000 064d 000f 6b28
1701160  0200 0db5 0500 1cdd 0000 4e3f 0000 001b 0000 4db7 007e 11e3 0000 02d3 0000 315f 000f 6b5c 0000 0038 b27c b66c 0000 060f
1701240  0000 064e 000f 6b60 0200 0db5 0500 1cdd 0000 4e47 0000 0013 0000 4db7 007a fbc3 0000 02d3 0000 315f 000f 6bc4 0000 0038
1701320  b27c b66c 0000 0610 0000 064f 000f 6bc8 0200 0db5 0500 1cdd 0000 4e47 0000 001b 0000 4db7 007e 18a3 0000 02d3 0000 315f
1701400  2954 0030 0002 438a 56f8 671c 682c 5aec 0200 0ad7 5fa0 671c 4768 33bc 24d0 0000 000f c398 0018 386c 3d30 2340 000f c314
1701460  000f 6c78 0000 0070 b27c b66c 0000 0611 0000 0650 000f 6c00 0200 0db5 0500 1cdd 0000 4fdf 0000 001b 0000 4db7 007e 1cc3
1701540  0000 02d3 0000 315f 000f 6c78 0000 0038 b27c b66c 0000 0612 0000 0651 000f 6c7c 0200 0db5 0500 1cdd 0000 4e4f 0000 001b
1701620  0000 4db7 007a fdc3 0000 02d3 0000 315f 2c78 0044 0002 438a 45c4 46d8 4768 9314 9460 001e 9300 9460 0018 3804 447c 0000
1701700  0200 0ad7 6d50 6d0c 242c 0000 000b 88c8 3804 43c0 0200 0ad7 6d50 6d0c 242c 0000 000b 8888 000f 6cfc 0000 0038 b27c b66c
1701760  0000 0613 0000 0652 000f 6d90 0200 0db5 0500 1cdd 0000 4e57 0000 001b 0000 4db7 007a ff43 0000 02d3 0000 315f 2c78 004c
1702040  0002 438a 5d10 0000 0500 500f 671c 5fa0 6840 6a50 6aa0 4728 001c 4790 0020 362c 382c 001c 3280 247c 0008 b97c 0024 3984
1702120  001c 0020 3984 0018 001c 38e8 386c 37f0 3cf4 234c 000f cdf4 000f 6d8c 0000 0034 000f c690 000f c6fc 000f c76c 000f c864
1702200  0000 0000 000f 8c6c 000f c3a8 000f caf8 000f ccb9 000f cd48 000f cbc0 2c78 005c 0002 438a 45d0 46d8 477c 9328 9460 001c
1702260  3818 43c0 0200 0ad7 6d94 6a00 24d0 0000 000b 88c8 001c 2c88 001a 3818 447c 0000 0200 0ad7 6d94 6a00 24d0 0000 000b 8888
1702340  0014 9300 9460 000a 2410 0000 000b 88c8 2410 0000 000b 8888 000f 6e08 0000 0038 b27c b66c 0000 0614 0000 0653 000f 6e0c
1702420  0200 0db5 0500 1cdd 0000 4e6f 0000 001b 0000 4db7 007b 0483 0000 02d3 0000 315f 2c78 0044 0002 438a 45c4 4700 477c 3380
1702500  001c 39f8 000f 6180 0024 3380 0020 3a4c 000f 6180 0024 33a0 3e70 0020 40b4 001c 000f 8609 001c 38e8 386c 37f0 3cf4 234c
1702560  000f c48c 000f 6e8c 0000 0038 b27c b66c 0000 0615 0000 0654 000f 6e90 0200 0db5 0500 1cdd 0000 4e6f 0000 0023 0000 4db7
1702640  007e 2463 0000 02d3 0000 315f 28c4 004c 000f c4f4 56f8 67ec 0018 682c 5758 671c 6a00 5aec 0200 0ad7 6c84 0018 671c 4768
1702720  5818 6750 6aa0 5b58 0200 0ad7 6c84 0018 67b8 3050 437c 3804 24d0 0000 000f c4e4 001c 2304 000f c48c 000f 6f24 0000 0038
1703000  b27c b66c 0000 0616 0000 0655 000f 6f28 0200 0db5 0500 1cdd 0000 4f9f 0000 0023 0000 4db7 007e 2723 0000 02d3 0000 315f
1703060  2938 0060 000f 5d18 56f8 6840 6a50 5758 671c 6af0 0020 5aec 0200 0ad7 6aa0 6af0 001c 4790 0024 47f8 0028 3050 3880 37f0
1703140  3280 247c 0008 b97c 002c 3984 0024 0028 3984 0020 0024 3984 001c 0020 3984 0018 001c 38e8 386c 37f0 3cf4 234c 000f c53c
1703220  000f 7008 0000 0038 b27c b66c 0000 0617 0000 0656 000f 700c 0200 0db5 0500 1cdd 0000 4f9f 0000 0043 0000 4db7 007e 29e3
1703300  0000 02d3 0000 315f 27f0 003c 000f 6f94 4e1c 0000 0000 0de7 3588 3600 3678 0020 36dc 0024 4450 0020 0200 0ad7 6b88 6c48
1703360  0018 4550 6c84 0020 6c48 001c 239c 0000 000f c4e4 28c4 0034 000f 6fc8 4e1c 0000 0000 0e27 370c 002c 3724 0028 3614 001c
1703440  3678 0020 36dc 0024 4538 6c48 002c 6c48 0028 22bc 000f c4e4 2954 003c 0002 438a 4e1c 0000 0000 0df7 2520 4740 49b8 35b0
1703520  0018 482c 001c 3614 0020 4864 0024 33d8 24d0 0000 000f 8608 001c 38e8 3d6c 2330 000f c4e4 000f 7094 0000 0038 b27c b66c
1703600  0000 0618 0000 0657 000f 7098 0200 0db5 0500 1cdd 0000 4e7f 0000 0013 0000 4db7 007b 0843 0000 02d3 0000 315f 2c78 0054
1703660  0002 438a 45d0 46ec 3410 0020 3364 3a4c 000f c5d0 0024 34a0 001c 3eec 0020 3818 3bf4 0000 000f c5f0 0020 33a0 3818 3c9c
1703740  0000 001c 000f c610 0020 3fe4 0018 001c 3da8 386c 37f0 3cf4 242c 0000 000f c630 000f 70fc 0000 0038 b27c b66c 0000 0619
1704020  0000 0658 000f 7100 0200 0db5 0500 1cdd 0000 4fa7 0000 001b 0000 4db7 007e 2e83 0000 02d3 0000 315f 2954 0030 0002 438a
```

```
1704100  56f8 6420 5e54 0000 0200 0ad7 67b8 5fa0 5758 6c34 6750 57b8 4b8c 0000 0000 0003 6784 22bc 000f c5d0 000f 7168 0000 0038
1704160  b27c b66c 0000 061a 0000 0659 000f 716c 0200 0db5 0500 1cdd 0000 4faf 0000 0023 0000 4db7 007e 2f83 0000 02d3 0000 315f
1704240  2954 0034 0002 438a 56f8 671c 682c 5aec 0200 0ad7 5fa0 671c 46ec 47e4 3468 37f0 24d0 0000 000f c6ec 001c 38e8 3d6c 2330
1704320  000f c5f0 000f 71d8 0000 0038 b27c b66c 0000 061b 0000 065a 000f 71dc 0200 0db5 0500 1cdd 0000 4fb7 0000 0023 0000 4db7
1704400  007e 3763 0000 02d3 0000 315f 28c4 0038 000f c748 56f8 6580 0018 5758 6c84 0018 6750 57b8 6620 001c 5818 6670 0018 3050
1704460  a8c8 001c aaf0 0001 af10 0018 239c 0000 000f c6ec 000f 72bc 0000 0070 b27c b66c 0000 061c 0000 065b 000f 7214 0200 0db5
1704540  0500 1cdd 0000 4fbf 0000 001b 0000 4db7 007e 3083 0000 02d3 0000 315f 000f 72bc 0000 0038 b27c b66c 0000 061d 0000 065c
1704620  000f 72c0 0200 0db5 0500 1cdd 0000 4e7f 0000 002b 0000 4db7 007e 3183 0000 02d3 0000 315f 2954 0074 0002 438a 56f8 67ec
1704700  001c 687c 0028 5758 6c84 001c 6a00 4768 47e4 4880 0018 0024 3804 43c0 0200 0ad7 6c84 001c 6af0 0020 24d0 0000 000b 88c8
1704760  002c 34c0 001c 3984 0018 0028 34a0 001c 3894 0024 3818 3c9c 0000 0020 000f c854 0020 3fe4 0018 001c 38e8 386c 37f0 3cf4
1705040  242c 0000 000f c630 000f 7374 0000 0038 b27c b66c 0000 061e 0000 065d 000f 7378 0200 0db5 0500 1cdd 0000 4fc7 0000 0033
1705120  0000 4db7 007e 42a3 0000 02d3 0000 315f 28c4 0048 000f 7338 56f8 6580 0024 5758 6c84 0024 6750 57b8 4b8c 0000 0000 000b
1705200  6784 5818 4b8c 0000 0000 0003 67b8 3754 0020 0018 3050 4598 0018 6c84 0024 6c48 0020 22bc 000f c854 28c4 0038 000f c8b8
1705260  56f8 6580 0020 5758 6c84 0020 6750 57b8 6620 0024 5818 6670 0020 3050 a8c8 0024 aaf0 ffff af10 0020 239c 0000 000f c854
1705340  000f 7418 0000 0070 b27c b66c 0000 061f 0000 065e 000f 73b0 0200 0db5 0500 1cdd 0000 4e07 0000 0013 0000 4db7 007a f243
1705420  0000 02d3 0000 315f 000f 7418 0000 0038 b27c b66c 0000 0620 0000 065f 000f 741c 0200 0db5 0500 1cdd 0000 4e07 0000 001b
1705500  0000 4db7 007e 4863 0000 02d3 0000 315f 2954 0034 0002 438a 56f8 671c 682c 5aec 0200 0b3f 6580 0018 4768 344c 3640 3614
1705560  0018 247c 000f c98c 0018 386c 3d30 2340 000f c90c 000f 7494 0000 0038 b27c b66c 0000 0621 0000 0660 000f 7498 0200 0db5
1705640  0500 1cdd 0000 4e07 0000 0023 0000 4db7 007e 4c63 0000 02d3 0000 315f 2954 0044 0002 438a 56f8 671c 682c 5aec 0200 0b3f
1705720  6580 0018 46ec 57b8 61e8 5b58 0200 0ad7 6d50 6c84 0018 47e4 3468 3614 0018 247c 000f c98c 001c 38e8 3d6c 2330 000f c98c
1706000  000f 7568 0000 0070 b27c b66c 0000 0622 0000 0661 000f 74d0 0200 0db5 0500 1cdd 0000 4e0f 0000 0013 0000 4db7 007a f343
1706060  0000 02d3 0000 315f 000f 7568 0000 0038 b27c b66c 0000 0623 0000 0662 000f 756c 0200 0db5 0500 1cdd 0000 4e0f 0000 001b
1706140  0000 4db7 007e 50c3 0000 02d3 0000 315f 28c4 0030 000f 7530 5d10 0000 0200 0b3f 6420 5758 6270 0018 5d7c 0000 0200 0ad7
1706220  6c34 6750 36b8 3678 0018 22bc 000f ca74 2954 0034 0002 438a 56f8 671c 682c 5aec 0200 0b3f 6580 0018 4768 344c 3640 3614
1706300  0018 247c 000f ca74 0018 386c 3d30 2340 000f ca18 000f 75d0 0000 0038 b27c b66c 0000 0624 0000 0663 000f 75d4 0200 0db5
1706360  0500 1cdd 0000 4e0f 0000 0023 0000 4db7 007e 53a3 0000 02d3 0000 315f 2954 0030 0002 438a 56f8 66c0 001c 0018 57b8 6088
1706440  5d10 0000 0200 0ad7 6b88 6750 4538 6c84 001c 6c84 0018 22bc 000f cae8 000f 7644 0000 0038 b27c b66c 0000 0625 0000 0664
1706520  000f 7648 0200 0db5 0500 1cdd 0000 4fe7 0000 0023 0000 4db7 007e 5743 0000 02d3 0000 315f 2954 003c 0002 438a 56f8 671c
1706600  682c 5aec 0200 0b3f 6580 0018 5758 6c84 0018 6a00 47e4 3468 3614 0018 24d0 0000 000f ca74 001c 38e8 3d6c 2330 000f cae8
1706660  000f 76ac 0000 0038 b27c b66c 0000 0626 0000 0665 000f 76b0 0200 0db5 0500 1cdd 0000 4e27 0000 0013 0000 4db7 007a f643
1706740  0000 02d3 0000 315f 2c78 0030 0002 438a 45d0 46ec 3310 3a4c 000f cb68 0018 37dc 3bf4 0000 000f cb88 0014 437c 37f0 3cf4
1707020  242c 0000 000f cba8 000f 772c 0000 0038 b27c b66c 0000 0627 0000 0666 000f 7730 0200 0db5 0500 1cdd 0000 4fff 0000 001b
1707100  0000 4db7 007e 5d43 0000 02d3 0000 315f 2954 0048 0002 438a 5d10 0000 0500 500f 5fa0 6868 6af0 001c 671c 69b0 4768 3410
1707160  0020 247c 000f cba8 0024 344c 3eec 0020 382c 001c 3c48 0000 000f cc28 0018 386c 3d30 2340 000f cba8 000f 7848 0000 00a8
1707240  b27c b66c 0000 0628 0000 0667 000f 7768 0200 0db5 0500 1cdd 0000 4fff 0000 0023 0000 4db7 007e 6143 0000 02d3 0000 315f
1707320  000f 779c 0000 0038 b27c b66c 0000 0629 0000 0668 000f 77a0 0200 0db5 0500 1cdd 0000 4fef 0000 0013 0000 4db7 007e 5b43
1707400  0000 02d3 0000 315f 000f 7848 0000 0038 b27c b66c 0000 062a 0000 0669 000f 784c 0200 0db5 0500 1cdd 0000 4fef 0000 0023
1707460  0000 4db7 007e 67a3 0000 02d3 0000 315f 2954 0074 0002 438a 5d7c 0000 0500 500f 6868 5fa0 65d0 0018 6a00 5ec0 0000 0018
1707540  0200 0b3f 6e08 5fa0 47d0 a858 aaf0 ffff aab4 0001 9fe8 ad18 0018 a858 aaf0 ffff a8c8 0018 9db0 ad64 34a0 001c 35b0 0018
1707620  24d0 0000 000f ccf4 0020 3df4 001c 56f8 6088 5aec 0200 0ad7 6e08 5fa0 38d4 2330 000f ccf4 000f 73b8 0000 0038 b27c b66c
1707700  0000 062b 0000 066a 000f 78bc 0200 0db5 0500 1cdd 0000 4ff7 0000 0013 0000 4db7 007e 5c43 0000 02d3 0000 315f 2954 0038
1707760  0002 438a 56f8 671c 682c 5aec 0200 0ad7 671c 6a50 46ec 33f4 35c8 39f8 000f cda4 001c 3d78 37f0 3a4c 000f cdc4 0014 2330
1710040  000f cb88 000f 79ac 0000 0078 b27c b66c 0000 062c 0000 066b 000f 79f4 0200 0db5 0500 1cdd 0000 5017 0000 001b 0000 4db7
1710120  007e 6d23 0000 02d3 0000 315f 000f 79ac 0000 0040 000f d0a1 000f cec8 000f cf58 000f d180 0000 0000 0000 0000 0000 0000
1710200  0000 0000 0000 0000 0000 0000 0000 0000 000f cca0 000f d191 0000 0000 2c78 007c 0002 438a 2520 4700 3410 0020 35c8 3280
1710260  24d0 0000 0011 2c3c 0024 2ba0 0024 001e 37c4 0020 56f8 4af8 0000 0daf 55f0 4af8 0000 0df7 6af0 001c 2c88 0018 2c58 3df4
1710340  0020 56f8 4b8c 0000 0000 0dd7 6af0 001c bfcc 33f4 382c 001c 329c 247c 0011 142c 001c 3d18 56f8 4af8 0000 0ddf 6d94 3d30
1710420  3cf4 234c 0011 63a4 000f 7aec 0000 00ec b27c b66c 0000 089c 0000 0992 000f 9e28 0200 0db5 0500 1cdd 0000 5d07 0000 0013
1710500  0000 3287 008a a343 0000 031b 0000 315f 000f 79f0 0000 000c 0010 f2c8 000f 7a28 0000 0038 b27c b66c 0000 062d 0000 066c
1710560  000f 7a2c 0200 0db5 0500 1cdd 0000 5017 0000 0033 0000 4db7 007e 6fa3 0000 02d3 0000 315f 000f 7a60 0000 0038 b27c b66c
1710640  0000 062e 0000 066d 000f 7a64 0200 0db5 0500 1cdd 0000 501f 0000 001b 0000 4db7 007e 6e23 0000 02d3 0000 315f 000f 7aec
1710720  0000 0038 b27c b66c 0000 062f 0000 066e 000f 7af0 0200 0db5 0500 1cdd 0000 5027 0000 001b 0000 4db7 007e 7a43 0000 02d3
1711000  0000 315f 2954 0054 0002 438a 5d10 0000 0500 500f 671c 6868 6af0 001c 6af0 0020 6af0 0024 46ec 4768 362c 37f0 3280 247c
1711060  0038 b97c 0028 3984 0020 0024 3984 001c 0020 3984 0018 001c 38e8 386c 37f0 3cf4 242c 0000 000f cfd0 000f 7c1c 0000 00e0
1711140  b27c b66c 0000 0630 0000 066f 000f 7b28 0200 0db5 0500 1cdd 0000 5027 0000 003b 0000 4db7 007e 7e83 0000 02d3 0000 315f
```

```
1711220 000f 7b5c 0000 0038 b27c b66c 0000 0631 0000 0670 000f 7b60 0200 0db5 0500 1cdd 0000 4e17 0000 0013 0000 4db7 007a f443
1711300 0000 02d3 0000 315f 000f 7b94 0000 0038 b27c b66c 0000 0632 0000 0671 000f 7b98 0200 0db5 0500 1cdd 0000 4e77 0000 001b
1711360 0000 4db7 007b 0643 0000 02d3 0000 315f 000f 7c1c 0000 0038 b27c b66c 0000 0633 0000 0672 000f 7c20 0200 0db5 0500 1cdd
1711440 0000 4e77 0000 0023 0000 4db7 007e 8843 0000 02d3 0000 315f 2954 0050 0002 438a 56f8 6580 0018 2520 46ec 35ec 47e4 3410
1711520 001c 57b8 6c84 0018 6b74 33d8 3af4 001c 000f 8608 0020 34c0 0018 4390 386c 3e70 001c 39f8 000f d170 001c 38e8 3d6c 37f0
1711600 3cf4 234c 000f d108 000f 7cb0 0000 0038 b130 b66c 0000 0634 0000 0673 000f 6361 0200 0db5 0500 1cdd 0000 502f 0000 002b
1711660 0000 4db7 007e 8b83 0000 02d3 0000 315f 28c4 005c 000f d1e0 56f8 671c 682c 5aec 0200 0ad7 6580 001c 5758 6c84 001c 6a00
1711740 4768 47f8 0020 4880 0018 001c 3050 3410 0024 3804 24d0 0000 000f 8598 0028 33f4 3e70 0024 3af4 0020 000f 8608 0020 3984
1712020 0018 001c 3da8 231c 000f d170 000f 9c18 0000 0554 6520 666f 7572 7468 2063 6c61 7573 6520 7769 7468 0a20 2020 204e 3d32
1712100 2074 6861 7420 6973 2074 6865 2061 6e73 7765 7220 796f 7520 6765 742e 2020 5468 6520 6f70 7469 6d69 7361 7469 6f6e 2069
1712160 7320 7573 7561 6c6c 790a 2020 2020 6120 676f 6f64 2069 6465 612e 2020 596f 7520 7769 6c6c 2066 7572 7468 6572 206e 6f74
1712240 6520 7468 6174 2074 6865 2066 6972 7374 2063 6c61 7573 6520 6f66 0a20 2020 203c 463e 5f6c 6f67 2f34 2069 7320 6f6e 6c79
1712320 2075 7365 6420 7768 656e 203c 463e 5f6c 6f67 285b 5d2c 2058 2920 6973 2063 616c 6c65 642c 2073 6f20 6974 0a20 2020 2063
1712400 6f75 6c64 2062 6520 6d6f 7665 6420 7570 2069 6e74 6f20 7468 6174 2070 726f 6365 6475 7265 2e0a 0a20 2020 2054 6865 203c
1712460 463e 5f6c 696e 2073 6368 656d 6120 6973 2065 6173 7920 746f 2067 7261 7370 2e20 2048 6f77 6576 6572 2c20 7468 6520 3c46
1712540 3e5f 6c6f 670a 2020 2020 7363 6865 6d61 2063 616e 2062 6520 636f 6e73 6964 6572 6162 6c79 206d 6f72 6520 6566 6669 6369
1712620 656e 742e 2020 436f 6e73 6964 6572 2073 6f72 7469 6e67 2e0a 2020 2020 4865 7265 203c 453e 203d 205b 5d2c 203c 473e 2858
1712700 2c5b 585d 292c 2061 6e64 203c 483e 2858 2c59 2c5a 2920 3d20 6d65 7267 6528 582c 592c 5a29 2e0a 2020 2020 4d65 7267 696e
1712760 6720 6120 7369 6e67 6c65 2065 6c65 6d65 6e74 2069 6e74 6f20 6120 6c69 7374 206f 6620 6c65 6e67 7468 204e 2063 6f73 7473
1713040 204f 284e 290a 2020 2020 7469 6d65 2c20 736f 203c 736f 7274 3e5f 6c69 6e20 776f 756c 6420 7461 6b65 204f 284e 2a2a 3229
1713120 2074 696d 6520 746f 2073 6f72 7420 6120 6c69 7374 0a20 2020 206f 6620 6c65 6e67 7468 204e 2c20 7768 6572 6561 7320 3c73
1713200 6f72 743e 5f6c 6f67 2077 6f75 6c64 2074 616b 6520 4f28 4e2e 6c67 4e29 2074 696d 652e 0a20 2020 2048 656e 6365 2074 6865
1713260 206e 616d 6573 2e20 203c 463e 5f6c 6f67 2069 7320 6120 7265 616c 2077 696e 2077 6865 6e20 7468 6520 636f 7374 206f 6620
1713340 7468 650a 2020 2020 3c48 3e20 6f70 6572 6174 696f 6e20 6973 206e 6f6e 2d74 7269 7669 616c 2061 6e64 2069 6e63 7265 6173
1713420 6573 2077 6974 6820 6269 6767 6572 0a20 2020 206f 7065 7261 6e64 732e 2020 4e75 6d65 7269 6361 6c20 616e 616c 7973 7473
1713500 206b 6e6f 7720 7468 6174 203c 7375 6d3e 5f6c 6f67 2069 7320 6f66 7465 6e0a 2020 2020 7468 6520 6265 7374 2077 6179 2074
1713560 6f20 7375 6d20 6120 6c69 7374 206f 6620 666c 6f61 7469 6e67 2070 6f69 6e74 206e 756d 6265 7273 2c20 7468 6174 2069 732c
1713640 0a20 2020 2074 6861 7420 6974 2067 6976 6573 2061 206d 6f72 6520 6163 6375 7261 7465 2061 6e73 7765 7220 2862 6563 6175
1713720 7365 2074 6865 7265 2061 7265 206f 6e6c 790a 2020 2020 4f28 6c67 4e29 2072 6f75 6e64 6f66 6673 2069 6e20 6974 2c20 6173
1714000 206f 7070 6f73 6564 2074 6f20 4f28 4e29 2069 6e20 3c73 756d 3e5f 6c69 6e29 2c20 6275 740a 2020 2020 7468 6174 2069 7320
1714060 6120 7261 7468 6572 206d 6172 6769 6e61 6c20 6361 7365 2e20 2073 756d 6c69 7374 2f33 2069 6e20 6c69 6272 6172 7928 6c69
1714140 7374 7329 0a20 2020 2069 7320 3c73 756d 3e5f 6c69 6e20 6265 6361 7573 6520 6974 2077 6173 206f 7269 6769 6e61 6c6c 7920
1714220 696e 7465 6e64 6564 2066 6f72 2069 6e74 6567 6572 732e 0a2a 2f0a 7562 7365 7428 5b5d 2c20 5f29 2e0a 6f72 645f 7375 6273
1714300 6574 285b 4865 6164 317c 5461 696c 315d 2c20 5b48 6561 6432 7c54 6169 6c32 5d29 203a 2d0a 0963 6f6d 7061 7265 284f 7264
1714360 6572 2c20 4865 6164 312c 2048 6561 6432 292c 0a09 6f72 645f 7375 6273 6574 284f 7264 6572 2c20 4865 6164 312c 2054 6169
1714440 6c31 2c20 5461 696c 3229 2e0a 0a6f 7264 5f73 7562 7365 7428 3d2c 205f 2c20 5461 696c 312c 2054 6169 6c32 2920 3a2d 0a09
1714520 6f72 645f 7375 6273 6574 2854 6169 6c31 2c20 5461 696c 3229 2e0a 6f72 645f 7375 000c 6f72 645f 6469 736a 6f69 6e74 0002
1714600 0012 6f72 645f 6469 736a 6f69 6e74 5f75 6e69 6f6e 000f 820a 000d 6f72 645f 696e 7465 7273 6563 7400 000a 6f72 645f 7375
1714660 6273 6574 000f 823a 000b 6f72 645f 7379 6d64 6966 6600 8242 0000 4ecf b328 f7e4 000c f7e8 0000 0000 000b 8808 0000 0000
1714740 000f 8258 000f 8268 000b 7379 6d64 6966 665f 6b65 7900 0000 0000 4ecf b328 0000 000c f840 0000 0000 0000 4e9f b328 82a0
1715020 000c f8ac 0000 0000 000c 6594 0100 4e17 0000 4e9f 0000 0004 000f 8760 000f 8760 0001 005b 0000 0000 0000 4ed7 b328 82b2
1715100 000c f8d8 0000 0000 0010 ad94 0000 0000 000c 65c4 0200 4edf 0000 4e9f 0000 0008 000f 8888 000f 8888 0001 005b 0000 0000
1715160 0000 4edf b328 82ea 000c f90c 0000 0000 000f 8300 000c 1554 000c 65f4 0300 4ee7 0000 4e9f 0000 000c 000f 88c0 000f 88c0
1715240 0001 005b 0000 0000 0000 4ee7 b328 8322 000c f940 0000 0000 001c afb0 000f 8390 0004 6361 7365 0000 000c 6624 0300 4eef
1715320 0000 4e9f 0000 000c 000f 89f8 000f 89f8 0001 005b 0000 0000 0000 4eef b328 835a 000c f974 0000 0000 0003 6275 7300 0000
1715400 0010 acfc 0000 0000 000c 6654 0200 4ef7 0000 4e9f 0000 0008 000f 8ae0 000f 8ae0 0001 005b 0000 0000 0000 4ef7 b328 00c7
1715460 000c f9a8 0000 0000 000f 83b8 000c 1148 000c 6684 0300 4eff 0000 4e9f 0000 000c 000f 93ec 000f 93ec 0001 005b 0000 0000
1715540 0000 4eff b328 00c7 000c f9dc 0000 0000 000a 3cf8 0000 0000 0005 626c 6f63 6b00 000c 66b4 0200 4f07 0000 4e9f 0000 0008
1715620 000f 8b38 000f 8b38 0001 005b 0000 0000 0000 4f07 b464 8402 000c fa10 000f 5d90 0005 756e 6974 7300 0004 6c69 6e65 0094
1715700 000f 8410 0300 4f07 0000 4e9f 0000 000c 000f 8bb4 000f 8bb4 0001 005b 0000 0000 000c 66e4 0300 4f0f 0000 4e9f 0000 000c
1715760 000f 8be8 000f 8be8 0001 005b 0000 0000 0000 4f0f b464 8472 000c fa78 000e 83f0 0004 7668 646c 0000 0003 6c65 7800 aa90
1716040 000f 8470 0200 4f0f 0000 4e9f 0000 0008 000f 8db8 000f 8db8 0001 005b 0000 0000 000c 6714 0200 4f17 0000 4e9f 0000 0008
1716120 000f 8e5c 000f 8e5c 0001 005b 0000 0000 0000 4f17 b328 84e2 000c fae0 0000 0000 0005 6172 7261 7900 0003 616e 6400 0000
1716200 000c 6744 0300 4f1f 0000 4e9f 0000 000c 000f 8e94 000f 8e94 0001 005b 0000 0000 0000 4f1f b328 851a 000c fb14 0000 0000
1716260 000f 8530 000c 0e59 000c 6774 0200 4f27 0000 4e9f 0000 0008 000f 8f8c 000f 8f8c 0001 005b 0000 0000 0000 4f27 b328 8552
```

```
1716340  000c fb48 0000 0000 0005 6265 6769 6e00 0003 656e 6400 0000 000c 6414 0300 4ea7 0000 4e9f 0000 000c 000f 9058 000f 9058
1716420  0001 005b 0000 0000 0000 4ea7 b328 0f03 000c fb7c 0000 0000 000f 85a8 000a 3218 000c 67a4 0300 4f2f 0000 4e9f 0000 000c
1716500  000f 9280 000f 9280 0001 005b 0000 0000 0000 4f2f b328 7009 000c fbb0 0000 0000 000f 85e0 000c 0e38 000c 6444 0300 4eaf
1716560  0000 4e9f 0000 000c 000f 954c 000f 954c 0001 005b 0000 0000 0000 4eaf b464 8615 000c fbe4 000f 5484 000f 8618 000a 355c
1716640  000f 85f8 0200 4eaf 0000 4e9f 0000 0008 000f 98b8 000f 98b8 0001 005b 0000 0000 000f 8630 0400 4eaf 0000 4e9f 0000 0010
1716720  000f 96e4 000f 96e4 0001 005b 0000 0000 0021 2240 2823 2939 302f 3031 2f30 3320 6f72 6473 6574 732e 706c 2020 2020 3336
1717000  2e31 2200 000e 802c 0100 2def 0000 4e9f 0000 c004 000f 8710 000f 8710 0001 005b 0000 0000 0000 5107 b328 1173 0010 1f18
1717060  0000 0000 0000 0028 000e 4894 b27c b66c 0000 059f 7fff ffff 000f bc14 0200 0db5 0100 32b5 0000 4e9f 0000 315f 0000 4e9f
1717140  b328 1c03 000f 86d0 0000 0000 2c78 0012 0002 438a 4e1c 0000 0000 4f37 228c 871a 2cac 08af 0002 439a 2ca0 8711 0000 0000
1717220  0000 0001 000f 86fc 000f 86fc 0002 438a 000e 8698 000d 736b 6970 5f63 6f6e 7374 616e 7400 000f 8910 0000 0000 27f0 0014
1717300  000f 8784 4e1c 0000 0000 0ad7 3050 c5a8 2cac 8759 0002 438a 2ca0 08af 0000 0004 0000 0002 000f 874c 000f 87b0 000f 87ba
1717360  000f 8798 28c4 0012 000f 87b0 4e1c 0000 0000 0007 228c 7459 000f 87a9 0000 0000 000f 8758 0000 0000 000f 8790 000f 87a0
1717440  2954 0014 0002 438a 56f8 6160 239c 0000 000f 87d4 000f 82a8 0200 4ed7 0000 4e9f 0000 0008 000f 87f8 000f 87f8 0001 005b
1717520  0000 0000 27f0 0014 000f 881c 4e1c 0000 0000 0ad7 3050 c5a8 2cac 08af 0002 438a 2ca0 756d 0000 0004 0000 0002 000f 87e4
1717600  000f 8840 000f 8852 000f 8830 28c4 0012 000f 8848 4e1c 0000 0000 0007 228c 883a 000f 8841 0000 0000 000f 87f0 0000 0000
1717660  000f 8828 000f 8838 2954 0020 0002 438a 56f8 6840 69b0 3788 8d94 aab4 0000 a484 2410 0000 000f 87d4 000d 7265 6164 5f63
1717740  6f6e 7374 616e 7400 000f 8aad 0000 0000 000f 8a90 0000 0000 2c78 0010 0002 438a 239c 0000 0008 e2bc 0000 511f b328 08af
1720020  0010 1fe4 0000 0000 27f0 0018 000c fdb8 4e1c 0000 0000 0007 57b8 6b88 5370 228c 2cac 08af 0002 438a 2ca0 88c1 0000 0000
1720100  0000 0001 000f 89a8 000c fdb8 000c fdc2 000f 531c 000f 8318 0500 4ee7 0000 4e9f 0000 0014 000f 8928 000f 8928 0001 005b
1720160  0000 0000 27f0 0024 000f 8950 4e1c 0000 0000 0de7 3588 5878 0018 6b88 6784 3600 239c 0000 000f 8328 2cac 8936 0002 438a
1720240  2ca0 1c03 0000 000c 0000 0003 000f 8904 000f 897c 0002 438a 000f 899c 000f 89f0 28c4 001a 000f 897c 4e1c 0000 0000 0df7
1720320  5878 0018 6b88 6bc8 228c 7905 000c 02b0 0000 0000 000f 8988 000f 8744 2954 001e 0002 438a 4e1c 0000 0000 0e27 5878 0018
1720400  6c08 55f0 6b88 6bc8 228c 08af 000f 8975 0000 0000 000f 895c 0000 0000 0000 510f b464 79bd 0010 2018 000f 9a78 000f 8c4c
1720460  0600 4f3f 0000 4e9f 0000 0018 000f 8cdc 000f 8cdc 0001 005b 0000 0000 000f 9528 000a 2674 27f0 0014 000c fe60 4e1c 0000
1720540  0000 0007 54f8 228c 2cac 7a75 0002 438a 2ca0 8a0e 0000 0000 0000 0001 000f 89e4 000c fe60 000c fe6a 000f 894c 000f 8358
1720620  0500 4eef 0000 4e9f 000c 0014 000f 8a5c 000f 8a5c 0001 005b 0000 0000 27f0 0020 000f 8a84 4e1c 0000 0000 0de7 359c 5878
1720700  0018 6bc8 6784 22bc 000f 8368 2cac 08af 0002 438a 2ca0 7b89 0000 000c 0000 0003 000f 8a3c 000f 8ab4 0002 438a 000f 8878
1720760  0000 0000 28c4 0016 000f 8ab4 4e1c 0000 0000 01f7 4a48 0018 228c 1c03 000f 8a48 0000 0000 000c ffc0 0000 0000 000f 8ac0
1721040  000f 8a9c 2954 001a 0002 438a 4e1c 0000 0000 0e27 5878 0018 6bc8 6c08 228c 1173 2954 000e 0002 438a 54f8 49a8 228c 0000
1721120  2c78 0028 0002 438a 2520 2e7c ad64 2ba0 0010 0012 2410 0000 000f 8420 0010 aa18 2e98 c5a8 2c58 723c 0000 512f b464 8b1a
1721200  0010 20e8 000f d6c4 000f 8450 0500 4f07 0000 4e9f 0000 0014 000f 8b70 000f 8b70 0001 005b 0000 0000 2cac 002b 0002 438a
1721260  2ca0 8b46 0000 0000 0000 0000 000c ff40 000c ff40 000c ff4a 000f 8a80 27f0 0012 000c ffb4 4e1c 0000 0000 0df7 228c 7961
1721340  2cac 8b66 0002 438a 2ca0 8b6e 0000 000c 0000 0003 000f 8b5c 000c fff8 0002 438a 000f 8ba4 000d 0004 000f 8aa4 000f 8d10
1721420  0000 0000 000f 8b95 0000 0000 000f 8b68 0000 0000 2c78 0010 0002 438a 239c 0000 000f 8480 0000 5127 b464 bc6d 0010 2080
1721500  000f 9ab4 27f0 0014 000f 8c28 4e1c 0000 0000 0007 54f8 228c 2cac 8bde 0002 438a 2ca0 8be6 0000 0000 0000 0001 000f 8bd4
1721560  000f 8c28 000f 8c32 000f 8c0c 000f 8be0 0012 6f72 645f 696e 7465 7273 6563 7469 6f6e 5f31 0000 0ad7 2954 0024 0002 438a
1721640  56f8 66c0 0018 001c 3574 36b8 3678 001c 3614 0018 239c 0000 000f 8c5c 000c 6804 0400 4f3f 0000 4e9f 0000 0010 000f 8c90
1721720  000f 8c90 0001 005b 0000 0000 0000 5137 b464 08af 000a 2790 000f d6d0 27f0 0014 000d 0124 4e1c 0000 0000 0007 5548 228c
1722000  2cac 8c86 0002 438a 2ca0 8c8e 0000 0000 0000 0001 000f 8c7c 000d 0124 000d 012e 000f 8cb4 000f 8c88 27f0 0024 000f 8d04
1722060  4e1c 0000 0000 0df7 3588 5878 001c 6b88 6784 3614 0018 22bc 000f 8480 2cac 7db9 0002 438a 2ca0 7ddd 0000 000c 0000 0003
1722140  000f 8cb8 000f 8d38 0002 438a 000f 8d58 0000 0000 28c4 0024 000f 8d38 4e1c 0000 0000 0de7 3588 3600 3678 0018 36dc 001c
1722220  239c 0000 000f 8c5c 000f 8d44 000f 8b9c 000f 901d 0000 0000 2954 0020 0002 438a 4e1c 0000 0000 0e27 35b0 0018 36dc 001c
1722300  239c 0000 000f 8c5c 000f 8d29 0000 0000 000f 8cc4 0000 0000 0012 6f72 645f 696e 7465 7273 6563 7469 6f6e 5f33 000f 8d72
1722360  2c78 0018 0002 438a 56f8 6420 3640 3600 239c 0000 000f 8da8 000c 6834 0300 4f47 0000 4e9f 0000 000c 000f 8e00 000f 8e00
1722440  0001 005b 0000 0000 2cac 7b41 0002 438a 2ca0 7b1d 0000 0000 0000 0000 000f 8d80 000f 8d80 000f 8d9a 000f 8d00 0000 2c1f
1722520  b328 7a91 000a 27f8 0000 0000 27f0 0014 000f 8e28 4e1c 0000 0000 0007 4960 228c 2cac 7a05 0002 438a 2ca0 79e1 0000 0000
1722600  0000 0001 000f 81ec 000f 9e28 000f 8e32 000f 8e24 000f 3df8 2954 0024 0002 438a 56f8 671c 682c 4768 33bc 247c 000f 8480
1722660  0018 386c 3d30 2340 000f 8da8 000c 705f 7665 7274 6963 6573 5f31 0000 2c78 0012 0002 438a 8d94 aab4 0000 a168 7220 8e79
1722740  0000 28ef b464 0013 000a 282c 0016 b068 27f0 0014 000f 8ebc 4e1c 0000 0000 0007 54f8 228c 2cac 001b 0002 438a 2ca0 0013
1723020  0000 0000 0000 0001 000f 8e80 000f 8ebc 000f 8ec6 000f 8eb8 000f 8e8c 2954 0028 0002 438a 56f8 671c 682c 46ec 3468 35c8
1723100  3ba0 0000 000f 8ef4 0018 3d6c 2410 000c 000f 8520 000f 8510 0400 4f1f 0000 4e9f 0000 0010 000f 8f18 000f 8f18 0001 005b
1723160  0000 0000 27f0 0014 000f 3f40 4e1c 0000 0000 0007 49c8 228c 2cac 2b37 0002 438a 2ca0 08af 0000 0000 0000 0001 000f 8f04
1723240  000f 8f40 000f 8f4a 000f 8f3c 000f 8f10 2954 0028 0002 438a 56f8 6580 0018 57b8 6620 001c 5c9c 001c 0200 0ad7 6b88 6c84
1723320  0018 22bc 000f 8ef4 0000 4db7 b328 8f79 000f bc18 0000 0000 27f0 0012 000d 02ec 4e1c 0000 0000 0007 228c 8f91 2cac 8f99
1723400  0002 438a 2ca0 001b 0000 0000 0000 0001 000f 8f78 000d 02ec 000d 02f6 000f 8fb0 000f 8f84 000f 8548 0400 4f27 0000 4e9f
```

| | | | | | | | | | | | | | | | | | | | | | | | | |
|---|---|---|---|---|---|---|---|---|---|---|---|---|---|---|---|---|---|---|---|---|---|---|---|---|
| 1723460 | 0000 | 0010 | 000f | 8ff0 | 000f | 8ff0 | 0001 | 005b | 0000 | 0000 | 27f0 | 001c | 000d | 0354 | 4e1c | 0000 | 0000 | 0df7 | 3588 | 3600 | 239c | 0000 | 000f | 8558 |
| 1723540 | 2cac | 3077 | 0002 | 438a | 2ca0 | 2b37 | 0000 | 0004 | 0000 | 0002 | 000f | 8fd4 | 000d | 0354 | 0002 | 438a | 000f | 8d30 | 000f | 8fe0 | 0000 | 0000 | 000d | 0360 |
| 1723620 | 000f | 9014 | 000c | 7365 | 6c65 | 6374 | 5f7a | 6572 | 6f73 | 0000 | 000f | 9510 | 000f | 903c | 000d | 0768 | 0000 | 0000 | 27f0 | 0014 | 000f | 9094 | 4e1c | 0000 |
| 1723700 | 0000 | 0007 | 54f8 | 228c | 2cac | 2b37 | 0002 | 438a | 2ca0 | 8c1d | 0000 | 0000 | 0000 | 0001 | 000f | 9044 | 000f | 9094 | 000f | 909e | 000f | 907c | 000f | 9050 |
| 1723760 | 000e | 6f72 | 645f | 7375 | 6274 | 7261 | 6374 | 5f31 | 0000 | 08af | 2954 | 0024 | 0002 | 438a | 56f8 | 66c0 | 0018 | 001c | 3574 | 36b8 | 3678 | 001c | 3614 | 0018 |
| 1724040 | 239c | 0000 | 000f | 90c8 | 0008 | e3ac | 0400 | 4f4f | 0000 | 4e9f | 0000 | 0010 | 000f | 9100 | 000f | 9100 | 0001 | 005b | 0000 | 0000 | 0000 | 290f | b328 | 90e9 |
| 1724120 | 000a | 2860 | 0000 | 0000 | 27f0 | 0018 | 000d | 03fc | 4e1c | 0000 | 0000 | 0007 | 5818 | 6b88 | 6bc8 | 228c | 2cac | 3077 | 0002 | 438a | 2ca0 | 3077 | 0000 | 0000 |
| 1724200 | 0000 | 0001 | 000f | 90e8 | 000d | 03fc | 000d | 0406 | 000f | 9124 | 000f | 90f4 | 000f | 8588 | 0600 | 4ea7 | 0000 | 4e9f | 0000 | 0018 | 000f | 917c | 000f | 917c |
| 1724260 | 0001 | 005b | 0000 | 0000 | 000e | 6f72 | 645f | 7375 | 6274 | 7261 | 6374 | 5f32 | 000f | 914e | 000c | 459c | 0400 | 4f57 | 0000 | 4e9f | 0000 | 0010 | 000f | 9238 |
| 1724340 | 000f | 9238 | 0001 | 005b | 0000 | 0000 | 2cac | 9181 | 0002 | 438a | 2ca0 | 0023 | 0000 | 000c | 0000 | 0003 | 000d | 0474 | 000f | 91dc | 0002 | 438a | 000f | 91fc |
| 1724420 | 000f | 9230 | 28c4 | 0020 | 000f | 91dc | 4e1c | 0000 | 0000 | 0e27 | 35b0 | 0018 | 36dc | 001c | 239c | 0000 | 000f | 90c8 | 000d | 0654 | 0000 | 0000 | 000d | 0480 |
| 1724500 | 0000 | 0000 | 000f | 91b0 | 000f | 91cc | 2954 | 0020 | 0002 | 438a | 4e1c | 0000 | 0000 | 0df7 | 3588 | 3614 | 0018 | 3678 | 001c | 22bc | 000f | 8598 | 000f | 91d5 |
| 1724560 | 0000 | 0000 | 000f | 91e8 | 0000 | 0000 | 000b | 636f | 756e | 745f | 6564 | 6765 | 7300 | 0000 | 000f | 9380 | 000f | 91c4 | 27f0 | 0014 | 000d | 04d8 | 4e1c | 0000 |
| 1724640 | 0000 | 0007 | 5548 | 228c | 2cac | 08af | 0002 | 438a | 2ca0 | 9239 | 0000 | 0000 | 0000 | 0001 | 000f | 9224 | 000d | 04d8 | 000d | 04e2 | 000f | 91a0 | 000b | 7472 |
| 1724720 | 616e | 7370 | 6f73 | 655f | 7300 | 0000 | 27f0 | 0014 | 000f | 92a8 | 4e1c | 0000 | 0000 | 0007 | 4960 | 228c | 2cac | 8ee1 | 0002 | 438a | 2ca0 | 8ec1 | 0000 | 0000 |
| 1725000 | 0000 | 0001 | 000f | 926c | 000f | 92a8 | 000f | 92b2 | 000f | 92a4 | 000f | 9278 | 2954 | 0024 | 0002 | 438a | 56f8 | 66c0 | 0018 | 001c | 3574 | 36b8 | 3678 | 001c |
| 1725060 | 3614 | 0018 | 239c | 0000 | 000f | 92dc | 000f | 85c0 | 0400 | 4f2f | 0000 | 4e9f | 0000 | 0010 | 000f | 9304 | 000f | 9304 | 0001 | 005b | 0000 | 0000 | 27f0 | 0018 |
| 1725140 | 000d | 05d0 | 4e1c | 0000 | 0000 | 0007 | 5818 | 6b98 | 6bc8 | 228c | 2cac | 08af | 0002 | 438a | 2ca0 | 9305 | 0000 | 0000 | 0000 | 0001 | 000f | 92ec | 000d | 05d0 |
| 1725220 | 000d | 05da | 000f | 9328 | 000f | 92f8 | 000f | 92cc | 0600 | 4f2f | 0000 | 4e9f | 0000 | 0018 | 000f | 934c | 000f | 934c | 0001 | 005b | 0000 | 0000 | 2cac | 1943 |
| 1725300 | 0002 | 438a | 2ca0 | 9366 | 0000 | 000c | 0000 | 0003 | 000d | 0648 | 000f | 9398 | 0002 | 438a | 000f | 93b9 | 000f | 93e4 | 28c4 | 0024 | 000f | 9398 | 4e1c | 0000 |
| 1725360 | 0000 | 0e27 | 35b0 | 0018 | 5878 | 001c | 6c08 | 67b8 | 239c | 0000 | 000f | 92dc | 2954 | 0020 | 0002 | 438a | 4e1c | 0000 | 0000 | 0df7 | 3588 | 3614 | 0018 | 3678 |
| 1725440 | 001c | 22bc | 000f | 85d0 | 000f | 921d | 0000 | 0000 | 000f | 93a4 | 0000 | 0000 | 000c | 705f | 746f | 5f73 | 5f67 | 726f | 7570 | 0000 | 27f0 | 0014 | 000f | 9428 |
| 1725520 | 4e1c | 0000 | 0000 | 0007 | 4960 | 228c | 2cac | 08c3 | 0002 | 438a | 2ca0 | 93e9 | 0000 | 0000 | 0000 | 0001 | 000f | 93d8 | 000f | 9428 | 000f | 9432 | 000f | 9370 |
| 1725600 | 0014 | 6f72 | 645f | 6469 | 736a | 6f69 | 6e74 | 5f75 | 6e69 | 6f6e | 5f31 | 00c3 | 2954 | 0024 | 0002 | 438a | 56f8 | 66c0 | 0018 | 001c | 3574 | 36b8 | 3678 | 001c |
| 1725660 | 3614 | 0018 | 239c | 0000 | 000f | 945c | 000c | 4604 | 0400 | 4f5f | 0000 | 4e9f | 0000 | 0010 | 000f | 9494 | 000f | 9494 | 0001 | 005b | 0000 | 0000 | 0000 | 4eaf |
| 1725740 | b328 | 9528 | 000f | 6290 | 0000 | 0000 | 27f0 | 0018 | 000d | 06e4 | 4e1c | 0000 | 0000 | 0007 | 5818 | 6b88 | 6bc8 | 228c | 2cac | 94a2 | 0002 | 438a | 2ca0 | 7694 |
| 1726020 | 0000 | 0000 | 0000 | 0001 | 000f | 947c | 000d | 06e4 | 000d | 06ee | 000f | 94b8 | 000f | 9488 | 000f | 944c | 0600 | 4f5f | 0000 | 4e9f | 0000 | 0018 | 000f | 94dc |
| 1726100 | 000f | 94dc | 0001 | 005b | 0000 | 0000 | 2cac | 08af | 0002 | 438a | 2ca0 | 94dd | 0000 | 0004 | 0000 | 0002 | 000d | 075c | 000f | 9504 | 0002 | 438a | 000d | 011c |
| 1726160 | 000f | 9544 | 2954 | 0024 | 0002 | 438a | 4e1c | 0000 | 0000 | 0e27 | 35b0 | 0018 | 5878 | 001c | 6c08 | 67b8 | 239c | 0000 | 000f | 945c | 0000 | 4ea7 | b328 | 08af |
| 1726240 | 000f | 625c | 0000 | 0000 | 27f0 | 0014 | 000f | 9580 | 4e1c | 0000 | 0000 | 0007 | 4960 | 228c | 2cac | 955e | 0002 | 438a | 2ca0 | 0643 | 0000 | 0000 | 0000 | 0001 |
| 1726320 | 000f | 9538 | 000f | 9580 | 000f | 958a | 000f | 9500 | 000b | 6f72 | 645f | 756e | 696f | 6e5f | 3100 | 958a | 2954 | 0024 | 0002 | 438a | 56f8 | 66c0 | 0018 | 001c |
| 1726400 | 3574 | 36b8 | 3678 | 001c | 3614 | 0018 | 239c | 0000 | 000f | 95b4 | 000c | 4624 | 0400 | 4f67 | 0000 | 4e9f | 0000 | 0010 | 000f | 95ec | 000f | 95ec | 0001 | 005b |
| 1726460 | 0000 | 0000 | 0000 | 3adf | b328 | 95c1 | 000f | 62f8 | 0000 | 0000 | 27f0 | 0018 | 000d | 07f8 | 4e1c | 0000 | 0000 | 0007 | 5818 | 6b88 | 6bc8 | 228c | 2cac | 95e5 |
| 1726540 | 0002 | 438a | 2ca0 | 08af | 0000 | 0000 | 0000 | 0001 | 000f | 9534 | 000d | 07f8 | 000d | 0802 | 000f | 9610 | 000f | 95e0 | 000f | 95a4 | 0600 | 4f67 | 0000 | 4e9f |
| 1726620 | 0000 | 0018 | 000f | 9634 | 000f | 9634 | 0001 | 005b | 0000 | 0000 | 2cac | 9646 | 0002 | 438a | 2ca0 | 0823 | 0000 | 000c | 0000 | 0003 | 000d | 0870 | 000f | 9698 |
| 1726700 | 0002 | 438a | 000f | 96bc | 000f | 96d8 | 28c4 | 0024 | 000f | 9698 | 4e1c | 0000 | 0000 | 0e27 | 35b0 | 0018 | 5878 | 001c | 6c08 | 67b8 | 239c | 0000 | 000f | 95b4 |
| 1726760 | 000b | 7b6c | 0000 | 0000 | 000d | 087c | 0000 | 0000 | 000f | 9668 | 000f | 9688 | 2954 | 0024 | 0002 | 438a | 4e1c | 0000 | 0000 | 0df7 | 3588 | 5878 | 001c | 6b88 |
| 1727040 | 6784 | 3614 | 0018 | 22bc | 000f | 8608 | 000f | 9691 | 0000 | 0000 | 000f | 96a4 | 0000 | 0000 | 27f0 | 0016 | 000f | 9708 | 4e1c | 0000 | 0000 | 0007 | 4960 | 49b8 |
| 1727120 | 228c | 05b3 | 2cac | 96dd | 0002 | 438a | 2ca0 | 08af | 0000 | 0000 | 0000 | 0001 | 000f | 96cc | 000f | 9708 | 000f | 9712 | 000f | 9658 | 2954 | 0028 | 0002 | 438a |
| 1727200 | 56f8 | 66c0 | 001c | 0020 | 3574 | 373c | 0018 | 36b8 | 3678 | 0020 | 3614 | 001c | 239c | 0000 | 000f | 9740 | 000f | 9614 | 0500 | 4f67 | 0000 | 4e9f | 0000 | 0014 |
| 1727260 | 000f | 976c | 000f | 976c | 0001 | 005b | 0000 | 0000 | 27f0 | 001c | 000d | 090c | 4e1c | 0000 | 0000 | 0007 | 5818 | 6b88 | 6bc8 | 5598 | 0018 | 228c | 2cac | 15af |
| 1727340 | 0002 | 438a | 2ca0 | 0007 | 0000 | 0000 | 0000 | 0001 | 000f | 9750 | 000d | 090c | 000d | 0916 | 000f | 9790 | 000f | 975c | 000f | 8650 | 0700 | 4eaf | 0000 | 4e9f |
| 1727420 | 0000 | 001c | 000f | 97e4 | 000f | 97e4 | 0001 | 005b | 0000 | 0000 | 000b | 6f72 | 645f | 756e | 696f | 6e5f | 3200 | 9629 | ffff | ffff | 0500 | 4f6f | 0000 | 4e9f |
| 1727500 | 0000 | 0014 | 000f | 9880 | 000f | 9880 | 0001 | 005b | 0000 | 0000 | 2cac | 0007 | 0002 | 438a | 2ca0 | 97f2 | 0000 | 000c | 0000 | 0003 | 000d | 0994 | 000f | 9818 |
| 1727560 | 0002 | 438a | 000f | 9840 | 000d | 09a0 | 0000 | 0000 | 000d | 09d4 | 000f | 9808 | 2954 | 0028 | 0002 | 438a | 4e1c | 0000 | 0000 | 0df7 | 3588 | 5878 | 001c | 6b88 |
| 1727640 | 6784 | 36dc | 0020 | 3614 | 0018 | 22bc | 000f | 8660 | 000f | 9811 | 0000 | 0000 | 000f | 9824 | 0000 | 0000 | 0000 | 3ad7 | b464 | 985a | 000f | 62c4 | 000f | d784 |
| 1727720 | 27f0 | 0020 | 000d | 0a34 | 4e1c | 0000 | 0000 | 0007 | 5818 | 6b88 | 6bc8 | 5878 | 0018 | 6b88 | 6bc8 | 228c | 2cac | 966d | 0002 | 438a | 2ca0 | 9629 | 0000 | 0000 |
| 1730000 | 0000 | 0001 | 000f | 9860 | 000d | 0a34 | 000d | 0a3e | 000f | 98a4 | 000f | 986c | 000b | 6f72 | 645f | 756e | 696f | 6e5f | 3300 | 98ba | 2c78 | 0024 | 0002 | 438a |
| 1730060 | 45c4 | 4700 | 3310 | 39f8 | 0008 | c83c | 0018 | 4390 | 386c | 37f0 | 3cf4 | 234c | 000f | 98ec | 000c | 8b84 | 0400 | 4f77 | 0000 | 4e9f | 0000 | 0010 | 000f | 9924 |
| 1730140 | 000d | 0af4 | 0001 | 005b | 0000 | 0000 | 000a | 6f72 | 6473 | 6574 | 732e | 706c | 0000 | 0000 | 2938 | 0016 | 000f | 994c | 4e1c | 0000 | 0000 | 0003 | 54f8 | 49b8 |
| 1730220 | 2edc | 933d | 27f0 | 992a | 000d | 0af4 | 2ca0 | 990a | 0000 | 000c | 0000 | 0003 | 000f | 990c | 000d | 0af4 | 0002 | 438a | 000f | 9990 | 000f | bc80 | 28c4 | 001a |
| 1730300 | 000f | 9968 | 4e1c | 0000 | 0000 | 000b | 5758 | 6160 | 4960 | 49a8 | 2edc | 996a | 28c4 | 0028 | 000d | 0af4 | 4e1c | 0000 | 0000 | 0013 | 5758 | 671c | 55f0 | 6270 |
| 1730360 | 0018 | 49e8 | 0018 | 3050 | 239c | 0000 | 000f | 8608 | 000f | 9918 | 000f | 9958 | 000f | 9974 | 0000 | 0000 | 0009 | 6465 | 6c69 | 6d69 | 7465 | 7200 | 2c78 | 0012 |
| 1730440 | 0002 | 438a | 4e1c | 0000 | 0000 | 4fcf | 228c | 0000 | 2aa8 | 99e0 | 000f | 99dc | 0010 | 898e | 000b | 8818 | 0000 | 0000 | 000f | 8288 | 000f | 99cc | 2b24 | 9b60 |
| 1730520 | 0002 | 438a | 0010 | d7ba | 2954 | 000c | 0002 | 438a | 48b0 | 7220 | 0008 | 6368 | 6172 | 5f6c | 6974 | 00e8 | 2aa8 | 9b78 | 000f | 9b74 | 0010 | 8dc8 | 0006 | 6469 |

```
1730600  6769 7473 000f 9a00 2b24 83a0 0002 438a 0010 8f0a 0008 696e 7465 6772 616c 009c 29c8 5d58 000f 9a3c 000f 7c5a 2b24 9a34
1730660  0002 438a 000f d1ea 0008 696e 6669 6e69 7479 0000 29c8 d74c 000f d754 000d b08e 0008 735f 665f 736f 6e73 006c 0008 735f
1730740  665f 6669 6e64 0078 b464 9ab8 0010 204c 0000 0000 0007 7365 7464 6966 6600 d70c 0008 735f 665f 6669 6c6c 009c 0008 735f
1731020  746f 5f6d 6170 00a8 b464 d6e0 000a 2f0c 0000 0000 b464 d6c8 0010 20b4 0000 0000 29c8 82b4 000f 9acc 000f 72fa 2b24 9ac4
1731100  0002 438a 000f 7342 0007 7061 636b 6167 6500 d658 29c8 9adc 000f 5d24 000f c7c6 0007 6775 6172 6465 6400 d640 29c8 5d1c
1731160  000f 9b08 000f 6e46 2b24 9b00 0002 438a 000f c4fe 0006 646f 776e 746f 000f d628 0007 7375 6274 7970 6500 0000 0009 706f
1731240  7274 5f6c 6973 7400 2b24 9128 0002 438a 000f c1f2 29c8 5d04 000f 5310 000f 6882 0009 756e 6465 725c 696e 6500 2954 000c
1731320  0002 438a 48f8 2e1c 0009 6261 7365 645f 6c69 7400 2b24 9a10 0002 438a 0010 8e24 0009 6465 6372 5f6c 6973 7400 0009 696e
1731400  6372 5f6c 6973 7400 0008 636f 6470 6f73 6531 0100 001d 2240 2823 2938 392f 3036 2f30 3120 6772 6170 6873 2e70 6c09 3332
1731460  2e31 2200 000f 946c 000f 896c 2c78 0048 0002 438a 2520 46d8 56f8 4af8 0000 523f 55f0 4af8 0000 0a0f 671c 332c 24d0 0000
1731540  0011 482c 0014 3400 56f8 4af8 0000 0a7f 55f0 4af8 0000 530f 6750 3844 31f0 234c 0011 13ec 000f 9e24 0000 0038 b27c b66c
1731620  0000 0999 0000 098f 0010 9174 0200 0db5 0500 1cdd 0000 57ff 0000 0013 0000 3287 0089 1503 0000 031b 0000 315f 2c78 01d4
1731700  0002 438a 2520 4700 56f8 4af8 0000 32e7 6750 3410 0024 3280 24d0 0000 0011 2f38 0028 3df4 0024 56f8 4b8c 0000 0000 0daf
1731760  6750 3410 0020 329c 24d0 0009 0011 13ec 0024 2ba0 0024 0010 37c4 0020 31bc 4a7c 0018 2c88 0166 2c30 0020 37c4 0020 56f8
1732040  4b8c 0000 0000 0daf 55f0 4af8 0000 0df7 6af0 001c 2c88 0018 2c58 3df4 0020 56f8 4b8c 0000 0000 0dd7 6af0 001c bfcc 33f4
1732120  382c 001c 31f0 247c 0011 142c 001c 4538 4b8c 0000 0000 0373 5370 4550 4b8c 0000 0000 037b 6b74 4538 4b8c 0000 0000 034b
1732200  6bb4 4550 4b8c 0000 0000 03a3 6b74 4538 4b8c 0000 0000 030b 6bb4 4550 4b8c 0000 0000 03d3 6b74 4538 4b8c 0000 0000 034b
1732260  6bb4 4550 4b8c 0000 0000 0363 6b74 4538 4b8c 0000 0000 030b 6bb4 4550 4b8c 0000 0000 034b 6b74 4538 4b8c 0000 0000 03a3
1732340  6bb4 4550 4b8c 0000 0000 034b 6b74 4538 4b8c 0000 0000 0373 6bb4 4550 4b8c 0000 0000 034b 6b74 4538 4b8c 0000 0000 02fb
1732420  6bb4 4550 4b8c 0000 0000 032b 6b74 4538 4b8c 0000 0000 0363 6bb4 4550 4b8c 0000 0000 0313 6b74 4538 4b8c 0000 0000 030b
1732500  6bb4 4550 4b8c 0000 0000 034b 6b74 4538 4b8c 0000 0000 0393 6bb4 4550 4b8c 0000 0000 030b 6b74 4538 4b8c 0000 0000 03b3
1732560  6bb4 247c 0011 31bc 001c 3d18 56f8 4af8 0000 0ddf 6d94 3d30 3cf4 234c 0011 68f4 000f 9ee4 0000 0038 b27c b66c 0000 089d
1732640  0000 0993 000f 9ee8 0200 0db5 0500 1cdd 0000 5e8f 0000 0013 0000 3287 008b 4943 0000 031b 0000 315f 2c78 0088 0002 438a
1732720  2520 46d8 56f8 4af8 0000 335f 6af0 001c 2ba0 0020 0010 37c4 001c 31bc 4a7c 0018 2c88 0010 2c58 3364 3af4 001c 0011 6004
1733000  001c 2ba0 001c 000e 37b0 31a4 4a7c 0014 2c89 0010 2c58 3348 4108 0000 0011 2ba4 0018 2ba0 0018 000e 379c 318c 4a7c 0010
1733060  2c88 0010 2c58 332c 40f4 0000 0011 66e0 0014 3100 56f8 4af8 0000 0ddf 6d0c 723c 000f d7b8 0000 1cf4 b27c b66c 0000 089e
1733140  0000 0994 000f 9f20 0200 0db5 0500 1cdd 0000 5927 0000 001b 0000 3287 008b 0e63 0000 031b 0000 315f 000f 9f54 0000 0038
1733220  b130 b66c 0000 099f 0000 0995 0010 b42d 0200 0db5 0500 1cdd 0000 5e97 0000 001b 0000 3287 008b 4c63 0000 031b 0000 315f
1733300  000f 9fd4 0000 0080 0000 0000 0000 0000 0011 695c 0000 0000 0011 67b4 0000 0000 0000 0000 0000 0000 0000 0000 0011 664c
1733360  0011 66f0 0011 6774 0000 0000 0011 669c 0000 0000 0011 6938 0011 699c 0011 682c 0011 67d4 0011 6784 0000 0000 0000 0000
1733440  0000 0000 0000 0000 0000 0000 0011 67c4 0000 0000 0000 0000 0000 0000 000a dc9d 000f a154 0000 0180 0000 0000 0000 0000
1733520  0011 695c 0000 0000 0000 0000 0000 0000 0011 5f48 0000 0000 0000 0000 0011 584c 0011 5bec 0000 0000 0000 0000 0000 0000
1733600  0011 5994 0011 59f0 0011 6064 0000 0000 0011 5b28 0000 0000 0011 6104 0000 0000 0011 5cac 0011 5df4 0000 0000 0011 5ec8
1733660  0010 6241 0011 5fcc 0011 6014 0011 6884 0011 61ac 0011 6180 0000 0000 0011 6278 0000 0000 0011 631c 0011 63ac 0011 6584
1733740  0011 6548 000b 1ead 0011 6538 0011 664c 0011 66f0 0011 6774 0011 635c 0000 0000 0000 0000 0011 6938 0011 699c 0000 0000
1734020  000b 4115 0011 5cbc 0011 5d10 0011 5d64 0000 0000 0000 0000 0000 0000 0011 67c4 0011 58ac 0000 0000 0011 588c 0000 0000
1734100  0000 0000 0000 0000 0000 0000 0000 0000 0000 0000 0000 0000 0011 67b4 0000 0000 0000 0000 0000 0000 0000 0000 0011 5bbc
1734160  0000 0000 0000 0000 0011 587c 0000 0000 0000 0000 0000 0000 0011 6288 0011 682c 0000 0000 0011 6784 0011 64d4 0011 6464
1734240  0011 65d0 0000 0000 0011 6228 0000 0000 0000 0000 0000 0000 0000 0000 0011 67fc 000f d194 0000 1a84 0000 0000 0000 0000
1734320  0000 0000 0000 0000 0000 0000 0000 0000 0000 0000 0000 0000 0000 0000 0000 0000 0000 0000 0000 0000 0000 0000 0000 0000
*
1751500  0000 0000 0012 7665 7274 6963 6573 5f61 6e64 5f7a 6572 6f73 0000 0000 000f 8694 0100 2def 0000 4db7 0000 0004 000f bc34
1751560  000f bc34 0001 005a 0000 0000 0000 0028 000f 86cc b27c b66c 0000 05fa 7fff ffff 0010 1884 0200 0db5 0100 32b5 0000 4db7
1751640  0000 315f 2cac 0000 0002 438a 2ca0 0000 0000 0000 0000 0001 000f 99ac 000f 99ac 0002 438a 000f bc58 000f 99b8 000f cea4
1751720  000f bea4 0011 bcb0 000a dca4 0004 636f 7374 0064 27f0 0014 000f bcac 4e1c 0000 0000 0007 54a8 228c 2cac 0000 0002 438a
1752000  2ca0 0000 0000 0000 0000 0001 000f bc74 000f bcac 000f bcb6 000f 9948 2954 0024 0002 438a 56f8 62c0 5de8 0000 0200 0ad7
1752060  6784 5fa0 5758 6bf4 6750 22bc 000f 6180 2c78 0020 0002 438a 2520 46ec 3310 247c 000f bd00 0014 37f0 3cf4 234c 0008 e2bc
1752140  000d 21a0 0200 4fd7 0000 4db7 0000 0008 000f bd24 000f bd24 0001 005a 0000 0000 27f0 0014 000f bd4c 4e1c 0000 0000 0007
1752220  54a8 228c 2cac 0000 0002 438a 2ca0 0000 0000 0000 0000 0001 000f bd10 000f bd4c 000f bd56 000f bd48 000f bd1c 2954 0028
1752300  0002 438a 56f8 62c0 5de8 0000 0200 0ad7 64a8 5758 6c34 55f0 6bf4 6750 239c 0000 000f bd00 000f 61b0 0300 4e97 0000 4db7
1752360  0000 000c 000f c054 000f c054 0001 005a 0000 0000 000c 8be4 0300 4f8f 0000 4db7 0000 000c 000f bdc8 000f bdc8 0001 005a
1752440  0000 0000 27f0 0014 000f 64cc 4e1c 0000 0000 0007 54f8 228c 2cac 0000 0002 438a 2ca0 0000 0000 0000 0000 0001 000f bdb4
1752520  000f 64cc 000f 64d6 000f bdec 000f bdc0 000f bd94 0500 4f8f 0000 4db7 0000 0014 000f be30 000f be58 0001 005a 0000 0000
1752600  000f bdf0 0400 4f8f 0000 4db7 0000 0010 000f be7c 000f 8ad0 0001 005a 0000 0000 27f0 0000 000f be58 2ca0 0000 0000 0000
1752660  0000 0000 000f 6534 000f be58 000f 653e 000f be54 0000 0000 2954 0024 0002 438a 57b8 6620 001c 5ec0 0000 001c 0200 0ad7
```

| | | | | | | | | | | | | | | | | | | | | | | | | |
|---|---|---|---|---|---|---|---|---|---|---|---|---|---|---|---|---|---|---|---|---|---|---|---|---|
| 1752740 | 6b88 | 5370 | 49c8 | 4a00 | 0018 | 228c | 27f0 | 0000 | 000f | 8ad0 | 2ca0 | 0000 | 0000 | 0000 | 0000 | 0000 | 000f | 65b8 | 000f | 8ad0 | 000f | 65c2 | 000f | bea0 |
| 1753020 | 0000 | 0000 | 000f | ce84 | 0000 | 0000 | 27f0 | 0014 | 000f | 6628 | 4e1c | 0000 | 0000 | 0007 | 54a8 | 228c | 2cac | 0000 | 0002 | 438a | 2ca0 | 0000 | 0000 | 0000 |
| 1753100 | 0000 | 0001 | 000f | beac | 000f | 6628 | 000f | 6632 | 000f | bee4 | 000f | beb8 | 000f | 5ee0 | 0400 | 4e2f | 0000 | 4db7 | 0000 | 0010 | 000f | bf1c | 000f | bf1c |
| 1753160 | 0001 | 005a | 0000 | 0000 | 27f0 | 0014 | 000f | bf44 | 4e1c | 0000 | 0000 | 0007 | 49c0 | 228c | 2cac | 0000 | 0002 | 438a | 2ca0 | 0000 | 0000 | 0000 | 0000 | 0001 |
| 1753240 | 000f | bf08 | 000f | bf44 | 000f | bf4e | 000f | bf40 | 000f | bf14 | 2954 | 0028 | 0002 | 438a | 56f8 | 6580 | 0018 | 57b8 | 6620 | 001c | 5c9c | 001c | 0200 | 0ad7 |
| 1753320 | 6b88 | 6c84 | 0018 | 22bc | 000f | bef8 | 27f0 | 0014 | 000f | 66cc | 4e1c | 0000 | 0000 | 0007 | 54a8 | 228c | 2cac | 0000 | 0002 | 438a | 2ca0 | 0000 | 0000 | 0000 |
| 1753400 | 0000 | 0001 | 000f | bf6c | 000f | 66cc | 000f | 66d6 | 000f | bfa4 | 000f | bf78 | 000f | 5f08 | 0400 | 4e37 | 0000 | 4db7 | 0000 | 0010 | 000f | bfdc | 000f | bfdc |
| 1753460 | 0001 | 005a | 0000 | 0000 | 27f0 | 0014 | 000f | c004 | 4e1c | 0000 | 0000 | 0007 | 49c8 | 228c | 2cac | 0000 | 0002 | 438a | 2ca0 | 0000 | 0000 | 0000 | 0000 | 0001 |
| 1753540 | 000f | bfc8 | 000f | c004 | 000f | c00e | 000f | c000 | 000f | bfd4 | 2954 | 0028 | 0002 | 438a | 56f8 | 6580 | 0018 | 57b8 | 6620 | 001c | 5c9c | 001c | 0200 | 0ad7 |
| 1753620 | 6c84 | 0018 | 6b88 | 22bc | 000f | bfb8 | 2c78 | 0014 | 0002 | 438a | 3640 | 35c8 | 239c | 0000 | 000f | bd84 | 27f0 | 0014 | 000f | 67e8 | 4e1c | 0000 | 0000 | 0007 |
| 1753700 | 4960 | 228c | 2cac | 0000 | 0002 | 438a | 2ca0 | 0000 | 0000 | 0000 | 0000 | 0001 | 000f | c040 | 000f | 67e8 | 000f | 67f2 | 000f | c078 | 000f | c04c | 000f | bd74 |
| 1753760 | 0400 | 4e97 | 0000 | 4db7 | 0000 | 0010 | 000f | c0b0 | 000f | c0b0 | 0001 | 005a | 0000 | 0000 | 27f0 | 0014 | 000f | 6878 | 4e1c | 0000 | 0000 | 0007 | 5548 | 228c |
| 1754040 | 2cac | 0000 | 0002 | 438a | 2ca0 | 0000 | 0000 | 0000 | 0000 | 0001 | 000f | c09c | 000f | 68d0 | 000f | 9b44 | 000f | c0d4 | 000f | c0a8 | 27f0 | 0014 | 000f | 6944 |
| 1754120 | 4e1c | 0000 | 0000 | 0007 | 54a8 | 228c | 2cac | 0000 | 0002 | 438a | 2ca0 | 0000 | 0000 | 0000 | 0000 | 0001 | 000f | c0d8 | 000f | 6944 | 000f | 694e | 000f | c110 |
| 1754200 | 000f | c0e4 | 2c78 | 0014 | 0002 | 438a | 36a4 | 3228 | 35ec | 22bc | 000f | c138 | 000f | 6048 | 0400 | 4e67 | 0000 | 4db7 | 0000 | 0010 | 000f | c160 | 000f | c160 |
| 1754260 | 0001 | 005a | 0000 | 0000 | 27f0 | 0016 | 000f | 69e4 | 4e1c | 0000 | 0000 | 0007 | 54a8 | 49c8 | 228c | 0000 | 2cac | 0000 | 0002 | 438a | 2ca0 | 0000 | 0000 | 0000 |
| 1754340 | 0000 | 0001 | 000f | c148 | 000f | 69e4 | 000f | 69ee | 000f | c184 | 000f | c154 | 000c | 8c04 | 0400 | 4f97 | 0000 | 4db7 | 0000 | 0010 | 000f | c1c0 | 000f | c1c0 |
| 1754420 | 0001 | 005a | 0000 | 0000 | 27f0 | 0016 | 000f | 6a68 | 4e1c | 0000 | 0000 | 0007 | 54a8 | 5548 | 228c | 0000 | 2cac | 0000 | 0002 | 438a | 2ca0 | 0000 | 0000 | 0000 |
| 1754500 | 0000 | 0001 | 000f | c1a8 | 000f | c1e8 | 000e | 8124 | 000f | c1e4 | 000f | c1b4 | 2954 | 001c | 0002 | 438a | 56f8 | 6580 | 0018 | 5818 | 6c84 | 0018 | 67b8 | 22bc |
| 1754560 | 000f | c198 | 000b | 646f | 745f | 7072 | 6f64 | 7563 | 7400 | 0000 | 2c78 | 0018 | 0002 | 438a | 3640 | 41e8 | 0000 | 0003 | 239c | 0000 | 000f | c23c | 000f | 5f38 |
| 1754640 | 0300 | 4e3f | 0000 | 4db7 | 0000 | 000c | 000f | c260 | 000f | c260 | 0001 | 005a | 0000 | 0000 | 27f0 | 0014 | 000f | c288 | 4e1c | 0000 | 0000 | 0a87 | 3050 | c5a8 |
| 1754720 | 2cac | 0000 | 0002 | 438a | 2ca0 | 0000 | 0000 | 0004 | 0000 | 0002 | 000f | c24c | 000f | c2b4 | 000f | c2be | 000f | c29c | 000f | c4a8 | 28c4 | 0014 | 000f | c2b4 |
| 1755000 | 4e1c | 0000 | 0000 | 0007 | 4960 | 228c | 000f | c2ad | 0000 | 0000 | 000f | c258 | 0000 | 0000 | 000f | c294 | 000f | c2a4 | 2954 | 0028 | 0002 | 438a | 56f8 | 6420 |
| 1755060 | 5e54 | 0000 | 0200 | 0ad7 | 5f8c | bfcc | a874 | aaf0 | 0001 | ac4c | 239c | 0000 | 000f | c23c | 0000 | 5097 | b328 | 0000 | 000f | d868 | 0000 | 0000 | 2c78 | 0018 |
| 1755140 | 0002 | 438a | 3640 | 41e8 | 0000 | 0003 | 239c | 0000 | 000f | c314 | 000f | 5f68 | 0300 | 4e47 | 0000 | 4db7 | 0000 | 000c | 000f | c338 | 000f | c338 | 0001 | 005a |
| 1755220 | 0000 | 0000 | 27f0 | 0014 | 000f | c35c | 4e1c | 0000 | 0000 | 0a87 | 3050 | c5a8 | 2cac | 0000 | 0002 | 438a | 2ca0 | 0000 | 0000 | 0004 | 0000 | 0002 | 000f | c324 |
| 1755300 | 000f | 6b90 | 000f | 6b9a | 000f | c370 | 28c4 | 0014 | 000f | 6b90 | 4e1c | 0000 | 0000 | 0007 | 4960 | 228c | 000f | c381 | 0000 | 0000 | 000f | c330 | 0000 | 0000 |
| 1755360 | 000f | c368 | 000f | c378 | 000d | 2200 | 0300 | 4fdf | 0000 | 4db7 | 0000 | 000c | 000f | c3dc | 000f | c3dc | 0001 | 005a | 0000 | 0000 | 0010 | 1c11 | 0000 | 0000 |
| 1755440 | 0010 | 1c24 | 0000 | 0000 | 000f | 6f64 | 0000 | 0000 | 000f | c928 | 000f | c964 | 27f0 | 0014 | 000f | c400 | 4e1c | 0000 | 0000 | 0a87 | 3050 | c5a8 | 2cac | 0000 |
| 1755520 | 0002 | 438a | 2ca0 | 0000 | 0000 | 0004 | 0000 | 0002 | 000f | c3c8 | 000f | c42c | 000f | c436 | 000f | c414 | 28c4 | 0014 | 000f | c42c | 4e1c | 0000 | 0000 | 0007 |
| 1755600 | 4960 | 228c | 000f | c425 | 0000 | 0000 | 000f | c3d4 | 0000 | 0000 | 000f | c40c | 000f | c41c | 2954 | 0020 | 0002 | 438a | 56f8 | 5fa0 | 671c | bfcc | a874 | aaf0 |
| 1755660 | 0001 | ac4c | 239c | 0000 | 000f | c398 | 0000 | 50bf | b328 | 0000 | 000f | f8e8 | 0000 | 0000 | 0000 | 5097 | b328 | 0000 | 000f | d894 | 0000 | 0000 | 0000 | 50bf |
| 1755740 | b328 | c45c | 000f | f314 | 0000 | 0000 | 000f | 6080 | 0400 | 4e6f | 0000 | 4db7 | 0000 | 0010 | 000f | c4b0 | 000f | c4b0 | 0001 | 005a | 0000 | 0000 | 27f0 | 0014 |
| 1756020 | 000f | 6e3c | 4e1c | 0000 | 0000 | 0007 | 5548 | 228c | 2cac | 0000 | 0002 | 438a | 2ca0 | 0000 | 0000 | 0000 | 0000 | 0001 | 000f | c49c | 000f | c4f4 | 000f | 9afc |
| 1756100 | 000f | c284 | 000c | 8a08 | 0400 | 4f9f | 0000 | 4db7 | 0000 | 0010 | 000f | c54c | 000f | 5d18 | 0001 | 005a | 0000 | 0000 | 2954 | 0028 | 0002 | 438a | 56f8 | 6580 |
| 1756160 | 0018 | 5818 | 6670 | 001c | 5c9c | 001c | 0200 | 0ad7 | 6c84 | 0018 | 5370 | 22bc | 000f | c48c | 0000 | 5117 | b328 | 0000 | 0010 | 1fb0 | 0000 | 0000 | 000f | c4d4 |
| 1756240 | 0800 | 4f9f | 0000 | 4db7 | 0000 | 0020 | 000f | c574 | 000f | c574 | 0001 | 005a | 0000 | 0000 | 27f0 | 0000 | 000f | 5d18 | 2ca0 | 0000 | 0000 | 0000 | 0000 | 0000 |
| 1756320 | 000f | 6ec0 | 000f | 5d18 | 000f | 6eca | 000f | c570 | 0000 | 0000 | 2cac | 0000 | 0002 | 438a | 2ca0 | 0000 | 0000 | 000c | 0000 | 0003 | 000f | 6f58 | 000f | 6fc8 |
| 1756400 | 0002 | 438a | 000f | c5a0 | 000f | 6fa0 | 000f | c3b8 | 000f | c599 | 0000 | 0000 | 000f | 6fd4 | 0000 | 0000 | 0000 | 510f | b328 | 0000 | 0010 | 1f84 | 0000 | 0000 |
| 1756460 | 0008 | e40c | 0300 | 4fa7 | 0000 | 4db7 | 0000 | 000c | 000f | c668 | 000f | c668 | 0001 | 005a | 0000 | 0000 | ffff | ffff | 0400 | 4faf | 0000 | 4db7 | 0000 | 0010 |
| 1756540 | 000f | c6b4 | 000f | c6b4 | 0001 | 005a | 0000 | 0000 | 000d | 2110 | 0300 | 4fbf | 0000 | 4db7 | 0000 | 000c | 000f | c794 | 000f | c794 | 0001 | 005a | 0000 | 0000 |
| 1756620 | 000f | 60f8 | 0500 | 4e7f | 0000 | 4db7 | 0000 | 0014 | 000f | c81c | 000f | c81c | 0001 | 005a | 0000 | 0000 | 27f0 | 0010 | 000f | da18 | 54a8 | 4a48 | 0018 | 2edc |
| 1756700 | 27f0 | 0016 | 000f | 70c8 | 4e1c | 0000 | 0000 | 0007 | 54a8 | 54f8 | 228c | 0000 | 2cac | 0000 | 0002 | 438a | 2ca0 | 0000 | 0000 | 0000 | 0000 | 0001 | 000f | c650 |
| 1756760 | 000f | 70c8 | 000f | 70d2 | 000f | c68c | 000f | c65c | 2c78 | 0010 | 0002 | 438a | 5758 | 6b48 | 5fa0 | 228c | 27f0 | 0014 | 000f | 7130 | 4e1c | 0000 | 0000 | 0007 |
| 1757040 | 49c8 | 228c | 2cac | 0000 | 0002 | 438a | 2ca0 | 0000 | 0000 | 0000 | 0000 | 0001 | 000f | c6a0 | 000f | 7130 | 000f | 713a | 000f | c6d8 | 000f | c6ac | 000d | 20e0 |
| 1757120 | 0400 | 4fb7 | 0000 | 4db7 | 0000 | 0010 | 000f | c720 | 000f | c748 | 0001 | 005a | 0000 | 0000 | 0000 | 5107 | b328 | 0000 | 0010 | 1eec | 0000 | 0000 | 2938 | 0014 |
| 1757200 | 000f | 719c | 4e1c | 0000 | 0000 | 0007 | 49c8 | 2edc | 27f0 | 0000 | 000f | c748 | 2ca0 | 0000 | 0000 | 0000 | 0000 | 0001 | 000f | c70c | 000f | c748 | 000f | 71a6 |
| 1757260 | 000f | c744 | 000f | c718 | 2954 | 0024 | 0002 | 438a | 5758 | 5fa0 | 6750 | 57b8 | 6620 | 0018 | 5818 | 6c84 | 0018 | 67b8 | 239c | 0000 | 000f | c6ec | 0000 | 4dbf |
| 1757340 | b328 | 0000 | 0010 | 1388 | 0000 | 0000 | 27f0 | 0016 | 000f | c7bc | 4e1c | 0000 | 0000 | 0007 | 54a8 | 54f8 | 228c | 0000 | 2cac | 0000 | 0002 | 438a | 2ca0 | 0000 |
| 1757420 | 0000 | 0000 | 0000 | 0001 | 000f | c77c | 000f | c7e0 | 000f | 9ae4 | 000f | c7b8 | 000f | c788 | 28c4 | 0024 | 000f | c7e0 | 56f8 | 4af8 | 0000 | 0003 | 671c | 5758 |
| 1757500 | 6464 | 57b8 | 6c34 | 6784 | 3050 | 22bc | 000f | c610 | 2954 | 001c | 0002 | 438a | 56f8 | 5fa0 | 671c | 5758 | 5fa0 | 6750 | 239c | 0000 | 000f | c610 | 27f0 | 0020 |
| 1757560 | 000f | 7244 | 4e1c | 0000 | 0000 | 0007 | 54a8 | 3588 | 3678 | 0018 | 320c | 22bc | 000f | c5d0 | 2cac | 0000 | 0002 | 438a | 2ca0 | 0000 | 0000 | 0000 | 0000 | 0001 |
| 1757640 | 000f | c7fc | 000f | 7244 | 000f | 724e | 000f | c840 | 000f | c808 | 000d | 2140 | 0600 | 4fc7 | 0000 | 4db7 | 0000 | 0018 | 000f | c890 | 000f | c8b8 | 0001 | 005a |
| 1757720 | 0000 | 0000 | 0000 | 4937 | b328 | 0000 | 000d | aac4 | 0000 | 0000 | 2938 | 001a | 000f | 72f0 | 4e1c | 0000 | 0000 | 0007 | 49c8 | 4a60 | 001c | 0018 | 2edc | 0000 |
| 1760000 | 27f0 | 0000 | 000f | c8b8 | 2ca0 | 0000 | 0000 | 0000 | 0000 | 0001 | 000f | c874 | 000f | c8b8 | 000f | 9ac0 | 000f | c8b4 | 000f | c880 | 2954 | 0024 | 0002 | 438a |

```
1760060  5758 5fa0 6750 57b8 6620 0020 5318 6c84 0020 67b8 239c 0000 000f c854 0400 505f b328 0000 000d aa20 0000 0000 2c78 0010
1760140  0002 438a 437c 22bc 000f c90c 000f 5e38 0300 4e07 0000 4db7 0000 000c 000f c930 000f c930 0001 005a 0000 0000 27f0 0014
1760220  000f c958 4e1c 0000 0000 0007 4960 228c 2cac 0000 0002 438a 2ca0 0000 0000 0004 0000 0002 000f c91c 000f 73e0 000f 73ea
1760300  000f c3c0 000f c9a8 28c4 0024 000f 73e0 5d10 0000 0200 0b3f 6580 0018 36b8 3640 3614 0018 239c 0000 000f c98c 000f c8fc
1760360  0400 4e07 0000 4db7 0000 0010 000f c9b0 000f c9b0 0001 005a 0000 0000 27f0 0014 000f 744c 4e1c 0000 0000 0007 49c8 228c
1760440  2cac 0000 0002 438a 2ca0 0000 0000 0000 0000 0001 000f c99c 000f 744c 000f 7456 000f c954 0300 5057 b328 0000 000d a9e8
1760520  0000 0000 2c78 0024 0002 438a 2520 46ec 437c 3310 2410 0000 000f ca18 0014 37f0 3cf4 234c 0008 c73c 000f 5e58 0300 4e0f
1760600  0000 4db7 0000 000c 000f ca3c 000f ca3c 0001 005a 0000 0000 27f0 0014 000f 7500 4e1c 0000 0000 0007 4960 228c 2cac 0000
1760660  0002 438a 2ca0 0000 0000 0004 0000 0002 000f ca28 000f 7530 000f 753a 000f ca84 000f ca98 000f ca08 0400 4e0f 0000 4db7
1760740  0000 0010 000f caa0 000f caa0 0001 005a 0000 0000 000f ca34 000f 750c 27f0 0014 000f 759c 4e1c 0000 0000 0007 49c8 228c
1761020  2cac 0000 0002 438a 2ca0 0000 0000 0000 0000 0001 000f ca8c 000f 759c 000f 75a6 000f ca60 000e 665f 746f 5f73 5f67 7261
1761100  7068 5f31 0000 0000 000d 2260 0400 4fe7 0000 4db7 0000 0010 000f cb20 000f cb20 0001 005a 0000 0000 0400 504f b328 0000
1761160  000d a9ac 0000 0000 27f0 0016 000f 7604 4e1c 0000 0000 0007 54a8 49c8 228c 0000 2cac 0000 0002 438a 2ca0 0000 0000 0000
1761240  0000 0001 000f cb08 000f 7604 000f 760e 000f cb44 000f cb14 0500 5047 b328 0000 000d a96c 0000 0000 000d 2290 0200 4fef
1761320  0000 4db7 0000 0008 000f ccc0 000f ccc0 0001 005a 0000 0000 000d 22c0 0200 4ff7 0000 4db7 0000 0008 000f cd6c 000f cd6c
1761400  0001 005a 0000 0000 000d 22f0 0300 4fff 0000 4db7 0000 000c 000f cbe8 000f cbe8 0001 005a 0000 0000 0003 7469 7000 0000
1761460  0400 4dbf b328 0300 000d a930 0000 0000 27f0 0016 000f 76e0 4e1c 0000 0000 5007 3574 48c0 7220 0000 2cac 0000 0002 438a
1761540  2ca0 0000 0000 0004 0000 0002 000f cbd0 000f 76e0 0002 438a 000f cc38 000f cd10 0003 6d61 7000 0000 000f cb98 0400 4fff
1761620  0000 4db7 0000 0010 000f cc5c 000f cc5c 0001 005a 0000 0000 000f cbdc 000f 76ec 27f0 001c 000f cc80 4e1c 0000 0000 2cc7
1761700  3588 3050 56f8 6b88 6c08 7220 2cac 0000 0002 438a 2ca0 0000 0000 0004 0000 0002 000f cc40 000f cc80 0002 438a 000f cc98
1761760  2954 0016 0002 438a 4e1c 0000 0000 1e9f 3588 48d0 7220 0000 000f cc4c 000f cc8c 0400 503f b328 0000 000d a8f4 0000 0000
1762040  000f cca0 000f ccb8 000b e004 0000 0000 2c78 0024 0002 438a 45d0 46ec 3310 3a4c 0008 c83c 0018 4390 386c 37f0 3cf4 234c
1762120  000f ccf4 000f cb58 0400 4fef 0000 4db7 0000 0010 000f cd24 000f 77d0 0001 005a 0000 0000 2938 0020 000f 77d0 4e1c 0000
1762200  0000 0003 4e70 0000 0000 5007 3588 3050 48d0 7220 27f0 0000 000f 77d0 2ca0 0000 0000 0000 0000 0001 000f cd04 000f 77d0
1762260  0002 438a 000f cc0c 000c 7570 6461 7465 5f63 6f73 7473 0000 27f0 0012 000f 787c 4e1c 0000 0000 0007 228c 0000 2cac 0000
1762340  0002 438a 2ca0 0000 0000 0000 0000 0001 000f cd58 000f 787c 000f 7386 000f cd90 000f cd64 0008 ba4c 0300 5017 0000 4db7
1762420  0000 000c 000f ce04 000f ce04 0001 005a 0000 0000 0008 e56c 0300 501f 0000 4db7 0000 000c 000f ceec 000f ceec 0001 005a
1762500  0000 0000 000d 696e 6974 6961 6c5f 636f 7374 7300 000f cd94 0600 5017 0000 4db7 0000 0018 000f ce50 000f ce50 0001 005a
1762560  0000 0000 2cac 0000 0002 438a 2ca0 0000 0000 0000 0000 0001 000f 6cac 000f 6cac 0002 438a 000f ce28 000f 6cb8 27f0 0024
1762640  000f ce78 4e1c 0000 0000 0df7 5d7c 0000 0200 0b3f 6160 4a18 0018 4a00 001c 228c 2cac 0000 0002 438a 2ca0 0000 0000 000c
1762720  0000 0003 000f ce2c 000f ce98 0002 438a 000f ceb8 000f cee4 28c4 0020 000f ce98 4e1c 0000 0000 0de7 3588 3614 0018 3678
1763000  001c 22bc 000f cda4 2954 0020 0002 438a 4e1c 0000 0000 0e27 359c 3614 0018 3678 001c 22bc 000f cda4 000f bc5d 0000 0000
1763060  000f ce38 0000 0000 0000 4dbf b328 d180 000d a860 0000 0000 27f0 0014 000f cf10 4e1c 0000 0000 0007 54f8 228c 2cac 0000
1763140  0002 438a 2ca0 0000 0000 0000 0000 0001 000f ced8 000f cf10 000f cf1a 000f ce74 2954 0028 0002 438a 56f8 671c 682c 46ec
1763220  57b8 6784 6a50 35c8 3ba0 0000 000f cf48 0018 231c 000f cdc4 ffff ffff 0300 5027 0000 4db7 0000 000c 000f cf98 000f cf98
1763300  0001 005a 0000 0000 0000 4dbf b328 0000 000d a9c0 0000 0000 000f 8898 000a 3010 0005 7574 696c 7300 27f0 001e 000f 7a94
1763360  4e1c 0000 0000 5007 5de8 0000 0200 0b3f 6b88 5370 228c 0000 2cac 0000 0002 438a 2ca0 0000 0000 0004 0000 0002 000f cf78
1763440  000f 7a94 0002 438a 000f cfe0 000f d124 000f cf38 0700 5027 0000 4db7 0000 001c 000f d00c 000f d00c 0001 005a 0000 0000
1763520  000f cf84 000f 7aa0 27f0 0022 000f d030 4e1c 0000 0000 0df7 359c 4a30 0018 9294 936c 4c70 0000 1e9f 7220 0000 2cac 0000
1763600  0002 438a 2ca0 0000 0000 000c 0000 0003 000f cfe8 000f d064 0002 438a 000f d080 28c4 001c 000f d064 4e1c 0000 0000 0de7
1763660  35b0 001c 239c 0000 000f cf48 000f d03c 0000 0000 000f d070 000f d04c 0018 3a74 000f d0a0 2954 001c 0002 438a 4e1c 0000
1763740  0000 0e27 35b0 0020 239c 0000 000f cf48 000f d055 0000 0000 000f cff4 0000 0000 0000 503f b328 0000 000d a88c 0000 0000
1764020  000e 4458 0000 0000 2c78 0020 0002 438a 2520 46ec 3310 247c 000f 5ea8 0014 37f0 3cf4 234c 000f 5ec8 0000 4dff b328 0000
1764100  000d a7f4 0000 0000 2c78 0020 0002 438a 36f4 0018 36b8 437c 4538 6c48 0018 5370 239c 0000 000f d108 000f 60b8 0400 4e77
1764160  0000 4db7 0000 0010 000f d12c 000f d12c 0001 005a 0000 0000 27f0 0014 000f 7bc8 4e1c 0000 0000 0007 49c8 228c 2cac 0000
1764240  0002 438a 2ca0 0000 0000 0000 0000 0001 000f d118 000f 7bc8 000f 7bd2 000f cfbc 000c 6e65 775f 6672 6f6e 7469 6572 0000
1764320  0008 ba8c 0500 502f 0000 4db7 0000 0014 000f d1b8 000f d1b8 0001 005a 0000 0000 0000 4dff b328 0000 000d a7c8 0000 0000
1764400  0012 c448 000f 99d4 0003 7877 6400 0000 27f0 0018 000f 7c50 4e1c 0000 0000 0007 54a8 4a48 0018 228c 2cac 0000 0002 438a
1764460  2ca0 0000 0000 0000 0000 0001 000f d1a0 000f d1e0 000f 9a30 000f d1dc 000f d1ac 2954 0014 0002 438a 56f8 5fa0 671c 22bc
1764540  000f d170 27f0 0014 000d ada0 4e1c 0000 0000 0007 54f8 228c 000f 6d69 6e69 6d61 6c5f 7472 6970 6c65 7300 d1f4 000f d200
1764620  000f c97c 0200 4e07 0000 3287 0000 0008 000f d240 000f d240 0041 0000 0000 0000 2c78 0010 0002 438a 239c 0000 000f 5e48
1764700  000f ca64 0200 4e0f 0000 3287 0000 0008 000f d270 000f d270 0041 0000 0000 0000 2c78 0010 0002 438a 239c 0000 000f 5e68
1764760  000f 5e78 0200 4e17 0000 3287 0000 0008 000f d2a0 000f d2a0 0041 0000 0000 0000 2c78 0010 0002 438a 239c 0000 000f 5e88
1765040  000f 5e98 0200 4e1f 0000 3287 0000 0008 000f d2d0 000f d2d0 0041 0000 0000 0000 2c78 0010 0002 438a 239c 0000 000f 5ea8
1765120  000f 5eb8 0200 4e27 0000 3287 0000 0008 000f d300 000f d300 0041 0000 0000 0000 2c78 0010 0002 438a 239c 0000 000f 5ec8
```

| | | | | | | | | | | | | | | | | | | | | | | | | |
|---|---|---|---|---|---|---|---|---|---|---|---|---|---|---|---|---|---|---|---|---|---|---|---|---|
| 1765200 | 000f | bee8 | 0200 | 4e2f | 0000 | 32a7 | 0000 | 0008 | 000f | d330 | 000f | d330 | 0041 | 0000 | 0000 | 0000 | 2c78 | 0010 | 0002 | 438a | 239c | 0000 | 000f | 5ef0 |
| 1765260 | 000f | bfa8 | 0200 | 4e37 | 0000 | 3287 | 0000 | 0008 | 000f | d360 | 000f | d360 | 0041 | 0000 | 0000 | 0000 | 2c78 | 0010 | 0002 | 438a | 239c | 0000 | 000f | 5f18 |
| 1765340 | 000f | c22c | 0200 | 4e3f | 0000 | 3287 | 0000 | 0008 | 000f | d390 | 000f | d390 | 0041 | 0000 | 0000 | 0000 | 2c78 | 0010 | 0002 | 438a | 239c | 0000 | 000f | 5f48 |
| 1765420 | 000f | c304 | 0200 | 4e47 | 0000 | 3287 | 0000 | 0008 | 000f | d3c0 | 000f | d3c0 | 0041 | 0000 | 0000 | 0000 | 2c78 | 0010 | 0002 | 438a | 239c | 0000 | 000f | 5f78 |
| 1765500 | 000f | 5fa8 | 0300 | 4e4f | 0000 | 3287 | 0000 | 000c | 000f | d3f0 | 000f | d3f0 | 0041 | 0000 | 0000 | 0000 | 2c78 | 0010 | 0002 | 438a | 239c | 0000 | 000f | 5fb8 |
| 1765560 | 000f | 5fd8 | 0300 | 4e57 | 0000 | 3287 | 0000 | 000c | 000f | d420 | 000f | d420 | 0041 | 0000 | 0000 | 0000 | 2c78 | 0010 | 0002 | 438a | 239c | 0000 | 000f | 5fe8 |
| 1765640 | 000f | 6010 | 0200 | 4e5f | 0000 | 3287 | 0000 | 0008 | 000f | d450 | 000f | d450 | 0041 | 0000 | 0000 | 0000 | 2c78 | 0010 | 0002 | 438a | 239c | 0000 | 000f | 6020 |
| 1765720 | 000f | c128 | 0200 | 4e67 | 0000 | 3287 | 0000 | 0008 | 000f | d480 | 000f | d480 | 0041 | 0000 | 0000 | 0000 | 2c78 | 0010 | 0002 | 438a | 239c | 0000 | 000f | 6058 |
| 1766000 | 000f | c47c | 0300 | 4e6f | 0000 | 3287 | 0000 | 000c | 000f | d4b0 | 000f | d4b0 | 0041 | 0000 | 0000 | 0000 | 2c78 | 0010 | 0002 | 438a | 239c | 0000 | 000f | 6090 |
| 1766060 | 000f | d0f8 | 0300 | 4e77 | 0000 | 3287 | 0000 | 000c | 000f | d4e0 | 000f | d4e0 | 0041 | 0000 | 0000 | 0000 | 2c78 | 0010 | 0002 | 438a | 239c | 0000 | 000f | 60c8 |
| 1766140 | 000f | c620 | 0200 | 4e7f | 0000 | 3287 | 0000 | 0008 | 000f | d510 | 000f | d510 | 0041 | 0000 | 0000 | 0000 | 2c78 | 0010 | 0002 | 438a | 239c | 0000 | 000f | 6108 |
| 1766220 | 000f | 6130 | 0200 | 4e87 | 0000 | 3287 | 0000 | 0008 | 000f | d540 | 000f | d540 | 0041 | 0000 | 0000 | 0000 | 2c78 | 0010 | 0002 | 438a | 239c | 0000 | 000f | 6140 |
| 1766300 | 000f | 6170 | 0200 | 4e8f | 0000 | 3287 | 0000 | 0008 | 000f | d570 | 000f | d570 | 0041 | 0000 | 0000 | 0000 | 2c78 | 0010 | 0002 | 438a | 239c | 0000 | 000f | 6180 |
| 1766360 | 000f | c07c | 0200 | 4e97 | 0000 | 3287 | 0000 | 0008 | 000f | d5a0 | 000f | d5a0 | 0041 | 0000 | 0000 | 0000 | 2c78 | 0010 | 0002 | 438a | 239c | 0000 | 000f | 61c0 |
| 1766440 | 0006 | 6964 | 5f74 | 6f6b | 000f | d5bc | 2954 | 000c | 0002 | 438a | 48b0 | 7220 | 0007 | 636f | 6d6d | 656e | 7400 | d5d4 | 0009 | 766c | 6578 | 5f6c | 6973 | 7400 |
| 1766520 | 0008 | 7668 | 646c | 546f | 6b73 | 0000 | 0009 | 7472 | 616e | 7370 | 6f72 | 7400 | 0008 | 7265 | 7365 | 7276 | 6564 | 0000 | 0009 | 7668 | 646c | 5f6c | 6578 | 7300 |
| 1766600 | 0006 | 6163 | 6365 | 7373 | 000f | d604 | 0009 | 6174 | 7472 | 6962 | 7574 | 6500 | 0009 | 636f | 6d70 | 6f6e | 656e | 7400 | 0006 | 656e | 7469 | 7479 | 000f | 9b14 |
| 1766660 | 0008 | 6765 | 6e65 | 7261 | 7465 | 0034 | 0007 | 6c69 | 6e6b | 6167 | 6500 | 9af0 | 0006 | 6f74 | 6865 | 7273 | 000f | d64c | 0007 | 7072 | 6f63 | 6573 | 7300 | 9ad8 |
| 1766740 | 0006 | 7265 | 636f | 7264 | 000f | d664 | 0008 | 7265 | 6769 | 7374 | 6572 | 0070 | 0006 | 7265 | 7475 | 726e | 000f | d67c | 0009 | 7072 | 6f6d | 7074 | 2e70 | 6c00 |
| 1767020 | 0006 | 7265 | 706f | 7274 | 0000 | 0000 | 0008 | 6675 | 6e63 | 7469 | 6f6e | 0000 | 0006 | 7369 | 676e | 616c | 000f | d6e8 | b464 | d6d4 | 000a | 275c | 0000 | 0000 |
| 1767100 | b464 | d6f8 | 000a | 27c4 | 0000 | 0000 | b464 | 8364 | 000a | 2964 | 0000 | 0000 | 0008 | 7365 | 7665 | 7269 | 7479 | 0088 | b464 | d6bc | 0010 | 1f58 | 0011 | 7408 |
| 1767160 | 0007 | 7072 | 6f6d | 7074 | 5f00 | 0000 | 2b24 | d770 | 0002 | 438a | 000f | fb8e | 2b24 | d728 | 0002 | 438a | 0010 | 418a | 29c8 | 9a7c | 000f | d718 | 0010 | 4162 |
| 1767240 | 0006 | 6275 | 6666 | 6572 | 0000 | 0000 | b464 | 8364 | 0001 | a834 | 000f | d6f4 | 2b24 | d740 | 0002 | 438a | 0010 | 1c82 | 2aa8 | 9a58 | 000f | d748 | 000d | b0be |
| 1767320 | 0009 | 7072 | 6f63 | 6564 | 7572 | 6500 | 29c8 | 9a88 | 000f | d70c | 000f | fb32 | b464 | 9a4c | 000d | aa90 | 0018 | 9f8c | b464 | d77c | 000d | aa5c | 0016 | b018 |
| 1767400 | 0008 | 7265 | 7374 | 5f6d | 7374 | 009c | 0009 | 6669 | 7273 | 745f | 6d73 | 7400 | 0009 | 6772 | 6170 | 6873 | 2e70 | 6c00 | 000f | d8cc | 0000 | 002c | b288 | b66c |
| 1767460 | 0000 | 06a3 | 7fff | ffff | 0010 | 1d38 | 0200 | 0db5 | 0100 | 15ad | 0100 | 33fd | 0000 | 000b | 0000 | 315f | 0039 | 2f68 | 6f6d | 652f | 6f73 | 6173 | 312f | 612f |
| 1767540 | 7669 | 6a61 | 792f | 5648 | 444c | 2f70 | 6172 | 7365 | 722f | 7072 | 6f6c | 6f67 | 2f6e | 6577 | 6e65 | 772f | 7633 | 2e31 | 2f67 | 7261 | 7068 | 7300 | 003c | 2f68 |
| 1767620 | 6f6d | 652f | 6f73 | 6173 | 312f | 612f | 7669 | 6a61 | 792f | 5648 | 444c | 2f70 | 6172 | 7365 | 722f | 7072 | 6f6c | 6f67 | 2f6e | 6577 | 6e65 | 772f | 7633 | 2e31 |
| 1767700 | 2f67 | 7261 | 7068 | 732e | 706c | 006d | 0000 | 002c | 000f | f8e4 | b27c | b66c | 0000 | 06a6 | 7fff | ffff | 000d | a7c4 | 0200 | 0db5 | 0200 | 2f35 | 0000 | 5097 |
| 1767760 | 0000 | 02eb | 0000 | 315f | 0000 | 002c | 000f | f910 | b27c | b66c | 0000 | 06ae | 7fff | ffff | 000d | a7f0 | 0200 | 0db5 | 0200 | 224d | 0000 | 5097 | 0000 | 3287 |
| 1770040 | 0000 | 315f | 000e | 6c69 | 7374 | 735f | 616e | 645f | 7365 | 7473 | 0000 | 0000 | 000f | d9e4 | 0000 | 00c8 | b27c | b66c | 0000 | 06a8 | 0000 | 06ad | 000a | d16d |
| 1770120 | 0200 | 0db5 | 0200 | 270d | 0000 | 5097 | 0000 | 3287 | 0000 | 315f | 000f | d930 | 0000 | 0038 | b27c | b66c | 0000 | 06a9 | 0000 | 06af | 000f | d960 | 0200 | 0db5 |
| 1770200 | 0500 | 1cdd | 0000 | 509f | 0000 | 001b | 0000 | 3287 | 0080 | ea03 | 0000 | 02eb | 0000 | 315f | 000f | d95c | 0000 | 002c | b4f0 | b4e4 | 0000 | 06a8 | 7fff | ffff |
| 1770260 | 0008 | b0dd | 0000 | 0000 | 0000 | 0000 | 000f | d9e8 | 0002 | 438a | 0010 | 1e30 | 000f | d9e4 | 0000 | 0038 | b27c | b66c | 0000 | 06aa | 0000 | 06b0 | 000f | d9e8 |
| 1770340 | 0200 | 0db5 | 0500 | 1cdd | 0000 | 509f | 0000 | 0023 | 0000 | 3287 | 0080 | ec03 | 0000 | 02eb | 0000 | 315f | 2954 | 0050 | 0002 | 438a | 56f8 | 6580 | 0018 | 2520 |
| 1770420 | 46ec | 35ec | 47e4 | 3410 | 001c | 57b8 | 6c84 | 0018 | 6b74 | 33d8 | 3af4 | 001c | 0010 | 1de0 | 0020 | 34c0 | 0018 | 4390 | 386c | 3e70 | 001c | 39f8 | 0010 | 1e00 |
| 1770500 | 001c | 38e8 | 3d6c | 37f0 | 3cf4 | 234c | 0010 | 1d80 | 000f | db70 | 0000 | 0038 | b130 | b66c | 0000 | 06ab | 0000 | 06b1 | 000f | d935 | 0200 | 0db5 | 0500 | 1cdd |
| 1770560 | 0000 | 50a7 | 0000 | 002b | 0000 | 3287 | 0080 | f003 | 0000 | 02eb | 0000 | 315f | 28c4 | 006c | 0010 | 1ca8 | 45b8 | 5758 | 67ec | 001c | 6a00 | 4768 | 47f8 | 0020 |
| 1770640 | 4880 | 0018 | 001c | 37dc | 447c | 0000 | 0200 | 0ad7 | 6c84 | 001c | 6af0 | 0028 | 24d0 | 0000 | 000c | 4138 | 002c | 2ecc | 3410 | 0024 | 3804 | 3c9c | 0000 | 0028 |
| 1770720 | 0010 | 1e20 | 0028 | 33f4 | 3e70 | 0024 | 3af4 | 0020 | 0010 | 1de0 | 0020 | 3984 | 0018 | 001c | 3da8 | 231c | 0010 | 1e00 | 2c78 | 00e8 | 0002 | 438a | 45e8 | 0030 |
| 1771000 | 46d8 | 31a4 | 2ba0 | 0034 | 0012 | 37c4 | 0030 | 31d4 | 002c | 4a7c | 002c | 2c88 | 0016 | 2c58 | 3410 | 002c | 382c | 0030 | 3bf4 | 0000 | 0011 | 23f8 | 0030 | 2ba0 |
| 1771060 | 0030 | 001e | 32f0 | 0024 | 4e1c | 0000 | 0000 | 5307 | 37c4 | 002c | 31d4 | 0028 | 4a7c | 0028 | 2c88 | 0018 | 2c58 | 3410 | 0028 | 3e70 | 002c | 32f0 | 0024 | 247c |
| 1771140 | 0011 | 4c28 | 002c | 31f4 | 0028 | 56f9 | 4b8c | 0000 | 0000 | 52ef | 6af0 | 0020 | 40b4 | 0024 | 0011 | 507c | 0024 | 3380 | 001c | 3c9c | 0000 | 0020 | 0011 | 25e8 |
| 1771220 | 0020 | 3df4 | 001c | 56f8 | 4b8c | 0000 | 0000 | 52af | 55f0 | 4af8 | 0000 | 52ef | 6aa0 | 2ba0 | 001c | 000e | 37b0 | 318c | 4a7c | 0010 | 2c88 | 0010 | 2c58 | 33bc |
| 1771300 | 3818 | 408c | 0011 | 23f8 | 0014 | 3d00 | 56f8 | 4af8 | 0000 | 0ddf | 6d0c | 234c | 0011 | 509c | 000f | dc0c | 0000 | 0038 | b27c | b66c | 0000 | 0849 | 0000 | 093f |
| 1771360 | 000f | dc10 | 0200 | 0db5 | 0500 | 1cdd | 000c | 5cc7 | 0000 | 0013 | 0000 | 3287 | 008a | 86c3 | 0000 | 031b | 0000 | 315f | 2c78 | 0064 | 0002 | 438a | 45c4 | 46d8 |
| 1771440 | 2ba0 | 0014 | 0030 | 2ba0 | 0014 | 001a | 3788 | 56f8 | 4b8c | 0000 | 0000 | 0a87 | 55f0 | 4af8 | 0000 | 0a87 | 6d0c | 723c | 2c58 | 3788 | 56f8 | 4af8 | 0000 | 0a8f |
| 1771520 | 6d0c | 723c | 2c30 | 0012 | 3788 | 56f8 | 4b8c | 0000 | 0000 | 4bcf | 6d0c | 723c | 2c58 | 3788 | 56f8 | 4af8 | 0000 | 2a37 | 6d0c | 723c | 000f | dcb0 | 0000 | 0038 |
| 1771600 | b27c | b66c | 0000 | 094a | 0000 | 0940 | 000f | dcb4 | 0200 | 0db5 | 0500 | 1cdd | 0000 | 5aef | 0000 | 0013 | 0000 | 3287 | 0089 | f283 | 0000 | 031b | 0000 | 315f |
| 1771660 | 2c78 | 006c | 0002 | 438a | 45c4 | 46d8 | 2ba0 | 0014 | 0010 | 3788 | 56f8 | 4af8 | 0000 | 24c7 | 6d0c | 723c | 2c30 | 0012 | 3788 | 56f8 | 4b8c | 0000 | 0000 | 5327 |
| 1771740 | 6d0c | 723c | 2c30 | 0012 | 3788 | 56f8 | 4b8c | 0000 | 0000 | 52df | 6d0c | 723c | 2c30 | 0012 | 3788 | 56f8 | 4b8c | 0000 | 0000 | 5267 | 6d0c | 723c | 2c58 | 3788 |
| 1772020 | 56f8 | 4af8 | 0000 | 52e7 | 6d0c | 723c | 000f | dd6c | 0000 | 0038 | b27c | b66c | 0000 | 084b | 0000 | 0941 | 000f | dd70 | 0200 | 0db5 | 0500 | 1cdd | 0000 | 5ccf |
| 1772100 | 0000 | 001b | 0000 | 3287 | 008a | 8983 | 0000 | 031b | 0000 | 315f | 2c78 | 0082 | 0002 | 438a | 45b8 | 4700 | 4754 | 2ba0 | 0018 | 001c | 379c | 56f8 | 4b8c | 0000 |
| 1772160 | 0000 | 0a87 | 6d50 | 3774 | 4e1c | 0000 | 0000 | 0a87 | 723c | 2c30 | 001a | 379c | 56f8 | 4af8 | 0000 | 0b3f | 6d50 | 3774 | 4e1c | 0000 | 0000 | 0b3f | 723c | 2c30 |
| 1772240 | 001a | 379c | 56f9 | 4af8 | 0000 | 280f | 6d50 | 3774 | 4e1c | 0000 | 0000 | 280f | 723c | 2c58 | 379c | 56f8 | 4b8c | 0000 | 0000 | 535f | 6d50 | 3774 | 4e1c | 0000 |

```
1772320 0000 535f 723c 6265 000f de0c 0000 0070 b27c b66c 0000 084c 0000 0942 000f dda8 0200 0db5 0500 1cdd 0000 55ff 0000 001b
1772400 0000 3287 0088 a263 0000 031b 0000 315f 000f de0c 0000 0038 b27c b66c 0000 084d 0000 0943 000f de10 0200 0db5 0500 1cdd
1772460 0000 5cd7 0000 001b 0000 3287 008a 8d43 0000 031b 0000 315f 2954 0030 0002 438a 56f8 671c 682c 4754 33d8 247c 0011 144c
1772540 0018 3d0c 56f8 4af8 0000 0abf 6750 3858 2420 0000 0011 51a8 000f df28 0000 0038 b27c b66c 0000 084e 0000 0944 000f df2c
1772620 0200 0db5 0500 1cdd 0000 5cdf 0000 0013 0000 3287 008a 9203 0000 031b 0000 315f 28c4 003c 000f de7c 2520 46ec 56f8 4af8
1772700 0000 297f 6750 33d8 3280 247c 0011 23f8 0018 3d0c 56f8 4af8 0000 0ddf 6d50 43c0 0100 2627 6d0c 234c 0011 52d8 28c4 0044
1772760 000f dec0 2520 46ec 56f8 4af8 0000 297f 55f0 4af8 0000 53c7 6750 33d8 3280 247c 0011 2b50 0018 3d0c 56f8 4af8 0000 0ddf
1773040 6150 43c0 0100 53c7 6d0c 234c 0011 52d8 2954 0064 0002 438a 2520 4700 56f8 4af8 0000 297f 6750 3410 001c 3280 24d0 0000
1773120 0011 23f8 0020 3df4 001c 56f8 4b8c 0000 0000 53c7 6750 33f4 329c 247c 0011 2b50 001c 3d18 56f8 4af8 0000 0ddf 6d94 43e4
1773200 0100 53c7 6d50 43c0 0100 2627 6d0c 234c 0011 52f8 000f dffc 0000 00a8 b27c b66c 0000 084f 0000 0945 000f df64 0200 0db5
1773260 0500 1cdd 0000 5cef 0000 0013 0000 3287 008a 9a23 0000 031b 0000 315f 000f df98 0000 0038 b27c b66c 0000 0850 0000 0946
1773340 000f df9c 0200 0db5 0500 1cdd 0000 5c8f 0000 0013 0000 3287 008a 7983 0000 031b 0000 315f 000f dffc 0000 0038 b27c b66c
1773420 0000 0851 0000 0947 000f e000 0200 0db5 0500 1cdd 0000 598f 0000 0013 0000 3287 0089 8dc3 0000 031b 0000 315f 2c78 002c
1773500 0002 438a 45b8 46ec 2ba0 0014 0008 2330 0011 21e0 2c30 000a 2410 0000 0011 2200 2c58 2330 0011 5468 000f e0bc 0000 0070
1773560 b27c b66c 0000 0852 0000 0948 000f e038 0200 0db5 0500 1cdd 0000 59cf 0000 001b 0000 3287 0089 9d03 0000 031b 0000 315f
1773640 000f e0bc 0000 0034 b27c b66c 0000 0853 0000 0949 000f e0c0 0200 0db5 0500 1cdd 0000 590f 0000 0013 0000 3287 0089 62e3
1773720 0000 031b 0000 315f 2c78 0050 0002 438a 45d0 46d8 2ba0 0018 000e 379c 318c 4a7c 0010 2c88 0014 2c58 379c 56f8 4b8c 0000
1774000 0000 52d7 6a00 bfcc 2ba0 0014 000a 3788 4a7c 000c 723c 2c58 3788 56f8 4b8c 0000 0000 539f 6d0c 723c 000f e210 0000 0038
1774060 b27c b66c 0000 0854 0000 094a 000f e214 0200 0db5 0500 1cdd 0000 5d0f 0000 0013 0000 3287 008a a843 0000 031b 0000 315f
1774140 2c78 011c 0002 438a 2520 46d8 56f8 4af8 0000 532f 55f0 4af8 0000 525f 6750 3410 0020 32b8 24d0 0000 0011 1754 0024 3df4
1774220 0020 56f8 4b8c 0000 0000 25d7 671c 3380 001c 247c 0011 5538 0020 3df4 001c 56f8 4b8c 0000 0000 52af 6aa0 2ba0 001c 000e
1774300 37b0 318c 4a7c 0010 2c88 0010 2c58 33bc 3818 408c 0011 1754 0014 3d00 56f8 4af8 0000 0ddf 6d0c 4550 4b8c 0000 0000 03cb
1774360 5370 4538 4b8c 0000 0000 0323 6bb4 4550 4b8c 0000 0000 037b 6b74 4538 4b8c 0000 0000 0313 6bb4 4550 4b8c 0000 0000 0103
1774440 6b74 4538 4b8c 0000 0000 032b 6bb4 4550 4b8c 0000 0000 033b 6b74 4538 4b8c 0000 0000 030b 6bb4 4550 4b8c 0000 0000 035b
1774520 6b74 4538 4b8c 0000 0000 031b 6bb4 4550 4b8c 0000 0000 030b 6b74 4538 4b8c 0000 0000 0383 6bb4 234c 0011 19bc 000f e2b0
1774600 0000 0038 b27c b66c 0000 0855 0000 094b 000f e2b4 0200 0db5 0500 1cdd 0000 5d1f 0000 0013 0000 3287 008a abc3 0000 031b
1774660 0000 315f 2c78 0068 0002 438a 45b8 46ec 2ba0 0014 0008 2330 0011 2180 2c30 000a 2410 0000 0011 21a0 2c30 000a 2410 0000
1774740 0011 2160 2c30 000a 2410 0000 0011 21c0 2c30 000a 2410 0000 0011 21e0 2c30 000a 2410 0000 0011 2220 2c30 000a 2410 0000
1775020 0011 15bc 2c58 2330 0011 22a0 000f e49c 0000 0070 b27c b66c 0000 0856 0000 094c 000f e2ec 0200 0db5 0500 1cdd 0000 5d17
1775100 0000 0013 0000 3287 008a a9c3 0000 031b 0000 315f 000f e49c 0000 0038 b27c b66c 0000 0857 0000 094d 000f e4a0 0200 0db5
1775160 0500 1cdd 0000 59a7 0000 0013 0000 3287 0099 99c3 0000 031b 0000 315f 2c78 017c 0002 438a 2520 46d8 56f8 4af8 0000 532f
1775240 6750 3410 0024 32b8 24d0 0000 0011 15dc 0028 3df4 0024 56f8 4b8c 0000 0000 25d7 671c 3380 0020 247c 0011 5604 0024 3df4
1775320 0020 56f8 4b8c 0000 0000 52af 6af0 001c 2ba0 0020 0010 37c4 001c 318c 4a7c 0010 2c88 0020 2c58 33bc 382c 001c 32d4 247c
1775400 0011 1754 001c 3348 40f4 0000 0011 1774 0014 3300 56f8 4af8 0000 0ddf 6d0c 4538 4b8c 0000 0000 0373 5370 4550 4b8c 0000
1775460 0000 037b 6b74 4538 4b8c 0000 0000 034b 6bb4 4550 4b8c 0000 0000 03a3 6b74 4538 4b8c 0000 0000 030b 6bb4 4550 4b8c 0000
1775540 0000 0393 6b74 4538 4b8c 0000 0000 030b 6bb4 4550 4b8c 0000 0000 0363 6b74 4538 4b8c 0000 0000 031b 6bb4 4550 4b8c 0000
1775620 0000 032b 6b74 4538 4b8c 0000 0000 0323 6bb4 4550 4b8c 0000 0000 0103 6b74 4538 4b8c 0000 0000 032b 6bb4 4550 4b8c 0000
1775700 0000 033b 6b74 4538 4b8c 0000 0000 030b 6bb4 4550 4b8c 0000 0000 035b 6b74 4538 4b8c 0000 0000 031b 6bb4 4550 4b8c 0000
1775760 0000 030b 6b74 4538 4b8c 0000 0000 0383 6bb4 234c 0011 19bc 000f e5a4 0000 0038 b27c b66c 0000 0858 0000 094e 000f e5a8
1776040 0200 0db5 0500 1cdd 0000 5d2f 0000 0013 0000 3287 008a b203 0000 031b 0000 315f 2c78 00d0 0002 438a 45b8 46ec 2ba0 0014
1776120 0010 37f0 3b4c 0000 0011 2180 0014 2eb0 2c30 000e 37f0 39a4 0011 2160 0014 2eb0 2c30 000e 37f0 39a4 0011 21c0 0014 2eb0
1776200 2c30 000e 37f0 39a4 0011 21e0 0014 2eb0 2c30 000e 37f0 39a4 0011 2200 0014 2eb0 2c30 000e 37f0 39a4 0011 2220 0014 2eb0
1776260 2c30 000e 37f0 39a4 0011 15bc 0014 2eb0 2c30 000e 37f0 39a4 0011 2240 0014 2eb0 2c30 000e 37f0 39a4 0011 1a64 0014 2eb0
1776340 2c30 000e 37f0 39a4 0011 1b78 0014 2eb0 2c30 000e 37f0 39a4 0011 2280 0014 2eb0 2c58 37f0 3b4c 0000 0011 22a0 000c 2eb0
1776420 000f e65c 0000 0070 b27c b66c 0000 0859 0000 094f 000f e5e0 0200 0db5 0500 1cdd 0000 5d27 0000 0013 0000 3287 008a b023
1776500 0000 031b 0000 315f 000f e65c 0000 0038 b27c b66c 0000 085a 0000 0950 000f e660 0200 0db5 0500 1cdd 0000 5b5f 0000 001b
1776560 0000 3287 008a 6643 0000 031b 0000 315f 2c78 0046 0002 438a 45d0 477c 3410 001c 329c 247c 0011 15dc 0020 3df4 001c 56f8
1776640 4b8c 0000 0000 24c7 6750 3880 3280 247c 0011 34b0 0018 379c 5d10 0000 0200 5d37 6d50 6d0c 723c 6d65 000f e6cc 0000 0038
1776720 b27c b66c 0000 085b 0000 0951 000f e6d0 0200 0db5 0500 1cdd 0000 5cff 0000 0013 0000 3287 008a a103 0000 031b 0000 315f
1777000 2c78 0038 0002 43da 45d0 46ec 2ba0 0018 000e 379c 3174 4a7c 000c 2c88 000e 2c58 3310 3a4c 0011 12f8 0014 3858 3d24 31f0
1777060 242c 0000 0011 144c 000f e878 0000 0038 b27c b66c 0000 085c 0000 0952 000f e87c 0200 0db5 0500 1cdd 0000 5d3f 0000 0013
1777140 0000 3287 008a b303 0000 031b 0000 315f 2c78 0174 0002 438a 2520 46d8 3364 247c 0011 3010 001c 3d18 56f8 4af8 0000 53af
1777220 671c 3348 24d0 0000 0011 5730 0018 332c 40f4 0000 0011 5750 0014 3d00 56f8 4af8 0000 52af 55f0 4af8 0000 53af 6d0c 4550
1777300 4b8c 0000 0000 0373 5370 4538 4b8c 0000 0000 037b 6bb4 4550 4b8c 0000 0000 034b 6b74 4538 4b8c 0000 0000 03a3 6bb4 4550
1777360 4b8c 0000 0000 034b 6b74 4538 4b8c 0000 0000 0373 6bb4 4550 4b8c 0000 0000 034b 6b74 4538 4b8c 0000 0000 0333 6bb4 4550
```

```
1777440 4b8c 0000 0000 032b 6b74 4538 4b8c 0000 0000 0323 6bb4 4550 4b8c 0000 0000 02fb 6b74 4538 4b8c 0000 0000 032b 6bb4 4550
1777520 4b8c 0000 0000 0383 6b74 4538 4b8c 0000 0000 03cb 6bb4 4550 4b8c 0000 0000 03a3 6b74 4538 4b8c 0000 0000 02fb 6bb4 4550
1777600 4b8c 0000 0000 0363 6b74 4538 4b8c 0000 0000 030b 6bb4 4550 4b8c 0000 0000 031b 6b74 4538 4b8c 0000 0000 034b 6bb4 4550
1777660 4b9c 0000 0000 039b 6b74 4538 4b8c 0000 0000 03cb 6bb4 4550 4b8c 0000 0000 0343 6b74 4538 4b8c 0000 0000 0383 6bb4 234c
1777740 0011 19bc 000f e8f0 0000 0038 b27c b66c 0000 085d 0000 0953 000f e8f4 0200 0db5 0500 1cdd 0000 581f 0000 0013 0000 3287
2000020 0089 1d83 0000 031b 0000 315f 2c78 0040 0002 438a 2520 46d8 56f8 4af8 0000 5337 55f0 4af8 0000 0a0f 671c 332c 24d0 0000
2000100 0011 5780 0014 3100 56f8 4af8 0000 0a7f 55f0 4af8 0000 0ddf 6d0c 723c 000f e9b8 0000 0070 b27c b66c 0000 085e 0000 0954
2000160 000f e92c 0200 0db5 0500 1cdd 0000 5d4f 0000 0013 0000 3287 008a bc03 0000 031b 0000 315f 000f e9b8 0000 0038 b27c b66c
2000240 0000 085f 0000 0955 000f e9bc 0200 0db5 0500 1cdd 0000 5d57 0000 0013 0000 3287 008a bec3 0000 031b 0000 315f 2954 002c
2000320 0002 438a 2520 46d8 332c 247c 0011 583c 0014 3300 56f8 4af8 0000 0ddf 671c 37dc 242c 0000 0011 5738 0027 7075 7464 625f
2000400 706f 7274 5f69 6e74 6572 6661 6365 5f73 6967 6e61 6c5f 6465 636c 6172 6174 696f 6e00 2064 000f ece4 0000 0038 b27c b66c
2000460 0000 0860 0000 0956 000f ece8 0200 0db5 0500 1cdd 0000 5d5f 0000 0013 0000 3287 008a c1e3 0000 031b 0000 315f 2c78 02f4
2000540 0002 438a 45e8 0038 4728 001c 2ba0 003c 0012 37c4 0038 31d4 0034 4a7c 0034 2c88 0016 2c58 37c4 0038 56f8 4af8 0000 537f
2000620 6af0 0034 bfcc 3410 0030 382c 0034 3280 24d0 0000 0011 2f38 0034 3df4 0030 56f8 4b8c 0000 0000 0daf 6af0 002c 2ba0 0030
2000700 001c 329c 4e1c 0000 0000 24c7 37c4 002c 31d4 0028 4a7c 0028 2c88 0019 2c58 3410 0028 382c 002c 329c 24d0 0000 0011 4b7c
2000760 002c 3410 0024 3e70 0028 32b8 24d0 0000 0011 13ec 0028 2ba0 0028 0012 37c4 0024 31d4 0020 4a7c 0023 2c88 00d0 2c58 3df4
2001040 0024 56f8 4b8c 0000 0000 526f 6af0 0020 4538 4af8 0000 0373 5370 4550 4b8c 0000 0000 037b 6b74 4538 4b8c 0000 0000 034b
2001120 6bb4 4550 4b8c 0000 0000 03a3 6b74 4538 4b8c 0000 0000 030b 6bb4 4550 4b8c 0000 0000 0393 6b74 4538 4b8c 0000 0000 030b
2001200 6bb4 4550 4b8c 0000 0000 0363 6b74 4538 4b8c 0000 0000 031b 6bb4 4550 4b8c 0000 0000 032b 6b74 4538 4b8c 0000 0000 0323
2001260 6bb4 4550 4b8c 0000 0000 0103 6b74 4538 4b8c 0000 0000 039b 6bb4 4550 4b8c 0000 0000 03ab 6b74 4538 4b8c 0000 0000 0313
2001340 6bb4 247c 0011 3abc 0024 2ba0 0024 003e 37c4 0020 4a7c 001c 2c88 0148 2c30 001c 37c4 0020 56f8 4af8 0000 0daf 55f0 4af8
2001420 0000 0df7 6aa0 2c88 0014 2c58 37c4 0020 56f8 4af8 0000 0dd7 6aa0 bfcc 3894 001c 3818 31f0 2430 0000 0011 142c 0018 4538
2001500 4b8c 0000 0000 0373 5370 4550 4b8c 0000 0000 037b 6b74 4538 4b8c 0000 0000 034b 6bb4 4550 4b8c 0000 0000 03a3 6b74 4538
2001560 4b8c 0000 0000 030b 6bb4 4550 4b8c 0000 0000 03d3 6b74 4538 4b8c 0000 0000 034b 6bb4 4550 4b8c 0000 0000 0363 6b74 4538
2001640 4b8c 0000 0000 030b 6bb4 4550 4b8c 0000 0000 034b 6b74 4538 4b8c 0000 0000 03a3 6bb4 4550 4b8c 0000 0000 034b 6b74 4538
2001720 4b6c 0000 0000 0373 6bb4 4550 4b8c 0000 0000 034b 6b74 4538 4b8c 0000 0000 0103 6bb4 4550 4b8c 0000 0000 0363 6b74 4538
2002000 4b8c 0000 0000 030b 6bb4 4550 4b8c 0000 0000 0373 6b74 4538 4b8c 0000 0000 033b 6bb4 4550 4b8c 0000 0000 034b 6b74 4538
2002060 4b9c 0000 0000 039b 6bb4 247c 0011 3abc 0018 346c 3d30 3cf4 242c 0000 0011 586c 000f ed5c 0000 0038 b27c b66c 0000 0861
2002140 0000 0957 000f ed60 0200 0db5 050c 1cdd 0000 5777 0000 0013 0000 3287 0088 f783 0000 031b 0000 315f 2c78 0040 0002 438a
2002220 2520 46d8 56f8 4af8 0000 5337 55f0 4af8 0000 500f 55f0 4af8 0000 0a0f 671c 332c 24d0 0000 0011 42f4 0014 3d00 56f8 4af8
2002300 0000 0a7f 6d0c 723c 000f ee14 0000 0070 b27c b66c 0000 0862 0000 0958 000f ed98 0200 0db5 0500 1cdd 0000 56f7 0000 001b
2002360 0000 3287 0088 d923 0000 031b 0000 315f 000f ee14 0000 0038 b27c b66c 0000 0863 0000 0959 000f ee18 0200 0db5 0500 1cdd
2002440 0000 5ae7 0000 001b 0000 3287 0089 f063 0000 031b 0000 315f 2c78 0048 0002 438a 4530 4714 4740 2ba0 001c 000e 3844 3818
2002520 379c 234c 0011 144c 2c58 37b0 56f8 4af8 0000 0a0f 6750 33bc 3bf4 0000 0011 142c 0014 3d00 56f8 4af8 0000 0a7f 6d0c 723c
2002600 000f ef34 0000 0070 b27c b66c 0000 0864 0000 095a 000f ee50 0200 0db5 0500 1cdd 0000 5c7f 0000 0013 0000 3287 008a 74c3
2002660 0000 031b 0000 315f 000f ef34 0000 0038 b27c b66c 0000 0865 0000 095b 000f ef38 0200 0db5 0500 1cdd 0000 58c7 0000 0013
2002740 0000 3287 0089 4cc3 0000 031b 0000 315f 27f0 0044 000f eec4 2520 46ec 33d8 35c8 3280 247c 0011 144c 0018 3d0c 56f8 4af8
2003020 0000 0ddf 6d50 4368 3b4c 0000 0011 5928 0010 43c0 0200 5d7f 6d0c 5370 242c 0000 0011 5948 2954 006c 0002 438a 2520 4700
2003100 3410 001c 35c8 329c 24d0 0000 0011 144c 0020 3df4 001c 56f8 4b8c 0000 0000 0a0f 6750 33f4 3280 247c 0011 1498 001c 3d18
2003160 56f8 4af8 0000 0a7f 55f0 4af8 0000 0ddf 6d94 37dc 3ba0 0000 0011 5928 0014 43c0 0200 5d7f 6d50 6d0c 242c 0000 0011 5948
2003240 000f f100 0000 00a8 b27c b66c 0000 0866 0000 095c 000f ef70 0200 0db5 0500 1cdd 0000 5d87 0000 0013 0000 3287 008a cc23
2003320 0000 031b 0000 315f 000f efa4 0000 0038 b27c b66c 0000 0867 0000 095d 000f efa8 0200 0db5 0500 1cdd 0000 5d8f 0000 0013
2003400 0000 3287 008a cf03 0000 031b 0000 315f 000f f100 0000 0038 b27c b66c 0000 0868 0000 095e 000f f104 0200 0db5 0500 1cdd
2003460 0000 58e7 0000 0013 0000 3287 0089 5523 0000 031b 0000 315f 2c78 0124 0002 438a 45e8 0038 46d8 31a4 2ba0 003c 0012 37c4
2003540 0038 31d4 0030 4a7c 0030 2c88 002a 2c58 3410 0034 382c 0038 3bf4 0000 0011 23f8 0038 3df4 0034 56f8 4b8c 0000 0000 0daf
2003620 6af0 0030 bfcc 37c4 0030 56f8 4b8c 0000 0000 5347 6af0 002c 2ba0 0030 0012 37c4 002c 31d4 0024 4a7c 0024 2c88 0032 2c58
2003700 37c4 002c 56f8 4af8 0000 0a0f 671c 3380 0028 247c 0011 5ab8 002c 3df4 0028 56f8 4b8c 0000 0000 0a7f 6af0 0024 bfcc 247c
2003760 0011 5ad8 0028 3380 0020 3c9c 0000 0024 0011 59e0 0024 3df4 0020 56f8 4b8c 0000 0000 524f 671c 3380 001c 247c 0011 5af8
2004040 0020 3df4 001c 56f8 4b8c 0000 0000 52af 55f0 4af8 0000 5347 6aa0 2ba0 001c 000e 37b0 318c 4a7c 0010 2c88 0010 2c58 33bc
2004120 3818 408c 0011 23f8 0014 3d00 56f8 4af8 0000 0ddf 6d0c 234c 0011 5b18 000f f1f4 0000 0070 b27c b66c 0000 0869 0000 095f
2004200 000f f13c 0200 0db5 0500 1cdd 0000 5da7 0000 0013 0000 3287 008a d7c3 0000 031b 0000 315f 000f f1f4 0000 0038 b27c b66c
2004260 0000 086a 0000 0960 000f f1f8 0200 0db5 0500 1cdd 0000 564f 0000 0013 0000 3287 0088 a7c3 0000 031b 0000 315f 2c78 0084
2004340 0002 438a 45dc 46d8 2ba0 0024 004c 3410 0020 3818 32b8 247c 0011 1a84 0024 3df4 0020 56f8 4b8c 0000 0000 09ff 55f0 4af8
2004420 0000 0a0f 6750 3410 001c 31f0 24d0 0000 0011 142c 0020 3df4 001c 56f8 4b8c 0000 0000 0a7f 6d0c 723c 2c58 33bc 3818 31f0
2004500 4698 247c 0011 1a84 0014 3d00 56f8 4af8 0000 09ff 671c 37dc 242c 0000 0011 1568 000f f290 0000 0038 b27c b66c 0000 086b
```

```
2004560  0000 0961 000f f294 0200 0db5 0500 1cdd 0000 3f5f 0000 001b 0000 3287 0089 a783 0000 031b 0000 315f 2c78 0064 0002 438a
2004640  45dc 4790 0020 3410 0024 32b8 24d0 0000 0011 2708 0028 3410 001c 3e70 0024 329c 24d0 0000 0011 3430 0024 3894 0020 3e70
2004720  001c 3280 24d0 0000 0011 2708 001c 3844 37f0 3a4c 0011 5bdc 001c 37b0 5d10 0000 0300 3f5f 6d94 6d50 6d0c 723c 000f f3ac
2005000  0000 0038 b27c b66c 0000 086c 0000 0962 000f f3b0 0200 0db5 0500 1cdd 0000 5967 0000 0013 0000 3287 0089 8083 0000 031b
2005060  0000 315f 2c78 00e4 0002 438a 56f8 4af8 0000 3f5f 671c 2520 24d0 0000 0011 5c0c 000c 4550 4b8c 0000 0000 03a3 5370 4538
2005140  4b8c 0000 0000 0373 6bb4 4550 4b8c 0000 0000 034b 6b74 4538 4b8c 0000 0000 030b 6bb4 4550 4b8c 0000 0000 0393 6b74 4538
2005220  4b8c 0000 0000 03a3 6bb4 4550 4b8c 0000 0000 039b 6b74 4538 4b8c 0000 0000 0373 6bb4 4550 4b8c 0000 0000 037b 6b74 4538
2005300  4b8c 0000 0000 031b 6bb4 4550 4b8c 0000 0000 0103 6b74 4538 4b8c 0000 0000 032b 6bb4 4550 4b8c 0000 0000 033b 6b74 4538
2005360  4b8c 0000 0000 0373 6bb4 4550 4b8c 0000 0000 030b 6b74 4538 4b8c 0000 0000 0393 6bb4 234c 0011 19bc 000f f41c 0000 0038
2005440  b27c b66c 0000 086d 0000 0963 000f f420 0200 0db5 0500 1cdd 0000 58af 0000 0013 0000 3287 0089 46e3 0000 031b 0000 315f
2005520  2c78 0038 0002 438a 2520 46d8 56f8 4af8 0000 534f 671c 332c 24d0 0000 0011 3658 0014 3d00 56f8 4af8 0000 52af 55f0 4af8
2005600  0000 534f 6d0c 723c 000f f4ac 0000 0038 b27c b66c 0000 086e 0000 0964 000f f4b0 0200 0db5 0500 1cdd 0000 5aa7 0000 001b
2005660  0000 3287 0089 e583 0000 031b 0000 315f 2954 0058 0002 438a 45dc 4790 0020 3410 0024 329c 24d0 0000 0011 2708 0028 3410
2005740  001c 3e70 0024 32b8 24d0 0000 0011 5c9c 0024 3894 0020 3e70 001c 3280 24d0 0000 0011 2708 001c 37b0 5d10 0000 0300 5ac7
2006020  6d94 6d50 6d0c 723c 000f f604 0000 0038 b27c b66c 0000 086f 0000 0965 000f f608 0200 0db5 0500 1cdd 0000 5dc7 0000 001b
2006100  0000 3287 008a e4e3 0000 031b 0000 315f 2c78 011e 0302 438a 45b8 4700 4754 2ba0 0018 001c 379c 56f8 4b8c 0000 0000 0df7
2006160  6d50 3774 4e1c 0000 0000 0df7 723c 2c30 003e 2ba0 0018 001c 379c 56f8 4b8c 0000 0000 0b3f 55f0 4af8 0000 0df7 6d50 2c88
2006240  0014 2c58 379c 56f8 4b8c 0000 0000 54b7 6d50 bfcc 3774 4c70 0000 54b7 723c 2c30 001a 379c 56f8 4af8 0000 0de7 6d50 3774
2006320  4e1c 0000 0000 0de7 723c 2c30 003e 2ba0 0018 001c 379c 56f8 4b8c 0000 0000 0de7 55f0 4af8 0000 0df7 6d50 2c88 0014 2c58
2006400  379c 56f8 4b8c 0000 0000 54bf 6d50 bfcc 3774 4c70 0000 54bf 723c 2c30 001a 379c 56f8 4af8 0000 0e27 6d50 3774 4e1c 0000
2006460  0000 0e27 723c 2c30 001a 379c 56f8 4af8 0000 0e27 55f0 4af8 0000 0df7 6d50 2c88 0014 2c58 379c 56f8 4b8c 0000 0000 0e2f
2006540  6d50 bfcc 3774 4c70 0000 0e2f 723c 0000 000f f6bc 0000 0038 b27c b66c 0000 0870 0000 0966 000f f6c0 0200 0db5 0500 1cdd
2006620  0000 5aaf 0000 001b 0000 3287 0089 e683 0000 031b 0000 315f 27f0 0040 000f f678 5d10 0000 0300 5ac7 4b8c 0000 0000 522f
2006700  671c 682c 4754 33d8 24d0 0000 0011 3cb0 0018 330c 56f8 4af8 0000 522f 6750 3858 2420 0000 0011 3cb0 2954 0040 0002 438a
2006760  5d10 0000 0300 5ac7 4b8c 0000 0000 522f 671c 692c 4754 33d8 24d0 0000 0011 3cb0 0018 3d0c 56f8 4af8 0000 522f 6750 3858
2007040  2420 0000 0011 3cd0 000f f774 0000 0038 b27c b66c 0000 0871 0000 0967 000f f778 0200 0db5 0500 1cdd 0000 5ab7 0000 001b
2007120  0000 3287 0089 e783 0000 031b 0000 315f 27f0 0040 000f f730 5d10 0000 0300 5ac7 4b8c 0000 0000 5317 671c 682c 4754 33d8
2007200  24d0 0000 0011 3cb0 0018 3d0c 56f8 4af8 0000 5317 6750 3858 2420 0000 0011 3cb0 2954 0040 0002 438a 5d10 0000 0300 5ac7
2007260  4b8c 0000 0000 5317 671c 682c 4754 33d8 24d0 0000 0011 3cb0 0018 3d0c 56f8 4af8 0000 5317 6750 3858 2420 0000 0011 3cd0
2007340  000f f828 0000 0038 b27c b66c 0000 0872 0000 0968 0010 60e0 0200 0db5 0500 1cdd 0000 5abf 0000 001b 0000 3287 0089 e883
2007420  0000 031b 0000 315f 0010 7265 7475 726e 5f73 7461 7465 6d65 6e74 0000 0008 bacc 0400 503f 0000 4dbf 0000 0010 000d acc0
2007500  000d acc0 0001 005c 0000 0000 000c 14cc 0400 4dbf 0000 4dbf 0000 0010 000d ad24 000d ad24 0001 005c 0000 0000 000f cb48
2007560  000e 8444 000b e024 0000 0000 000f caf8 000f f804 000b e034 0000 0000 000f c9d4 000f f814 000f f94c 0000 002c b288 b66c
2007640  0000 06b2 7fff ffff 0010 1e38 0200 0db5 0100 15ad 0100 33fd 0000 000b 0000 315f 0041 2f68 6f6d 652f 6f73 6173 312f 612f
2007720  7669 6a61 792f 5648 444c 2f70 6172 7365 722f 7072 6f6c 6f67 2f6e 6577 6e65 772f 7633 2e31 2f6c 6973 7473 5f61 6e64 5f73
2010000  6574 7300 0044 2f68 6f6d 652f 6f73 6173 312f 612f 7669 6a61 792f 5648 444c 2f70 6172 7365 722f 7072 6f6c 6f67 2f6e 6577
2010060  6e65 772f 7633 2e31 2f6c 6973 7473 5f61 6e64 5f73 6574 732e 706c 0025 0000 002c 0010 1ee8 b27c b66c 0000 06b5 7fff ffff
2010140  000f d864 0200 0db5 0200 2f35 0000 50bf 0000 02f3 0000 315f 0000 002c 000a 2e70 b27c b66c 0000 06c4 7fff ffff 000f d890
2010220  0200 0db5 0200 224d 0000 50bf 0000 3287 0000 315f 0011 6c69 7374 735f 616e 645f 7365 7473 2e70 6c00 000f fbb4 0000 01e0
2010300  b27c b66c 0000 06b7 0000 06c3 000a d16d 0200 0db5 0200 270d 0000 50bf 0000 3287 0000 315f 000f f9b0 0000 0038 b27c b66c
2010360  0000 06b8 0000 06c5 000f f9e0 0200 0db5 0500 1cdd 0000 228f 0000 0013 0000 3287 0081 f243 0000 02f3 0000 315f 000f f9dc
2010440  0000 002c b4f0 b4e4 0000 06b7 7fff ffff 0008 b0dd 0000 0000 0000 0000 000f fc54 0002 438a 0010 4240 000f fa14 0000 0038
2010520  b27c b66c 0000 06b9 0000 06c6 000f fa18 0200 0db5 0500 1cdd 0000 50c7 0000 0013 0000 3287 0081 f3e3 0000 02f3 0000 315f
2010600  000f fa4c 0000 0038 b27c b66c 0000 06ba 0000 06c7 000f fa50 0200 0db5 0500 1cdd 0000 50c7 0000 001b 0000 3287 0081 f583
2010660  0000 02f3 0000 315f 000f fa84 0000 0038 b27c b66c 0000 06bb 0000 06c8 000f fa88 0200 0db5 0500 1cdd 0000 50c7 0000 0023
2010740  0000 3287 0081 f983 0000 02f3 0000 315f 000f fabc 0000 0038 b27c b66c 0000 06bc 0000 06c9 000f fac0 0200 0db5 0500 1cdd
2011020  0000 50cf 0000 0013 0000 3287 0081 fe43 0000 02f3 0000 315f 000f faf4 0000 0038 b27c b66c 0000 06bd 0000 06ca 000f faf8
2011100  0200 0db5 0500 1cdd 0000 50d7 0000 001b 0000 3287 0082 0263 0000 02f3 0000 315f 000f fbb4 0000 0038 b27c b66c 0000 06be
2011160  0000 06cb 000f fbb8 0200 0db5 0500 1cdd 0000 50d7 0000 0023 0000 3287 0082 0483 0000 02f3 0000 315f 28c4 005c 000f fb84
2011240  56f8 67ec 0018 692c 46ec 4768 47e4 3228 4550 6af0 001c 5fa0 4538 6c84 0018 6d3c 2410 0000 000d 7d78 0024 3228 3380 0020
2011320  3ba0 0000 000d 7d78 0024 3e70 0020 3c9c 0000 001c 000c 4158 001c 2ecc 23e4 0000 0010 4090 2954 002c 0002 438a 56f8 6580
2011400  001c 370c 0018 57b8 6c84 001c 6784 3050 4550 6c84 001c 6c48 0018 22bc 0010 4090 000f fc50 0000 0070 b27c b66c 0000 06bf
2011460  0000 06cc 000f fbf0 0200 0db5 0500 1cdd 0000 50df 0000 001b 0000 3287 0082 0763 0000 02f3 0000 315f 000f fc50 0000 0038
2011540  b27c b66c 0000 06c0 0000 06cd 000f fc54 0200 0db5 0500 1cdd 0000 50e7 0000 001b 0000 3287 0082 0d23 0000 02f3 0000 315f
2011620  2c78 002c 0002 438a 45b8 46ec 4768 37f0 3b4c 0000 000d 8078 0018 38d4 4268 0000 0000 0003 2410 0000 0010 41c4 000f fd58
```

```
2011700 0000 0038 b130 b66c 0000 06c1 0000 06ce 000f f9b5 0200 0db5 0500 1cdd 0000 50e7 0000 0023 0000 3287 0082 0e23 0000 02f3
2011760 0000 315f 2954 0034 0002 438a 56f8 6580 001c 5758 65d0 0018 bfcc a8c8 001c a8c8 0018 9de0 ad18 0018 a890 a8c8 0018 9d88
2012040 ac90 22bc 0010 41c4 2c78 009c 0002 438a 2520 46d8 3410 0024 35c8 32b8 24d0 0000 0011 23f8 0028 3df4 0024 56f8 4b8c 0000
2012120 0000 0daf 671c 3380 0020 247c 0011 418c 0024 3df4 0020 56f8 4b8c 0000 0000 52cf 671c 3380 001c 247c 0011 2b00 0020 3df4
2012200 001c 56f8 4b8c 0000 0000 52af 55f0 4af8 0000 52cf 6aa0 2ba0 001c 000e 37b0 318c 4a7c 0010 2c88 0010 2c58 33bc 3818 408c
2012260 0011 23f8 0014 3d00 56f8 4af8 0000 0ddf 6d0c 723c 000f fdd0 0000 0039 b27c b66c 0000 081f 0000 0915 000f fdd4 0200 0db5
2012340 0500 1cdd 0000 5b57 0000 0013 0000 3287 008a 0c63 0000 031b 0000 315f 2c78 0040 0002 438a 45c4 46d8 2ba0 0014 0018 3788
2012420 56f8 4af8 0000 52bf 671c 37dc 242c 0000 0011 41d8 2c58 3788 56f8 4af8 0000 2477 6750 3844 31f0 234c 0011 2b50 000f fef4
2012500 0000 0038 b27c b66c 0000 0820 0000 0916 000f fef8 0200 0db5 0500 1cdd 0000 5817 0000 0013 0000 3287 0089 1c83 0000 031b
2012560 0000 315f 2c78 00ec 0002 438a 2520 46d8 56f8 4af8 0000 2397 55f0 4af8 0000 0a0f 671c 332c 24d0 0000 0011 4218 0014 3d00
2012640 56f8 4af8 0000 0a7f 55f0 4af8 0000 0ddf 6d0c 4550 4b8c 0000 0000 032b 5370 4538 4b9c 0000 0000 039b 6bb4 4550 4b8c 0000
2012720 0000 03ab 6b74 4538 4b8c 0000 0000 030b 6bb4 4550 4b8c 0000 0000 0363 6b74 4538 4b8c 0000 0000 021b 6bb4 4550 4b8c 0000
2013000 0000 0103 6b74 4538 4b8c 0000 0000 031b 6bb4 4550 4b8c 0000 0000 034b 6b74 4538 4b8c 0000 0000 0393 6bb4 4550 4b8c 0000
2013060 0000 032b 6b74 4538 4b8c 0000 0000 0373 6bb4 4550 4b8c 0000 0000 032b 6b74 4538 4b8c 0000 0000 023b 6bb4 234c 0011 19bc
2013140 000f ff58 0000 0038 b27c b66c 0000 0821 0000 0917 000f ff5c 0200 0db5 0500 1cdd 0000 5b67 0000 0013 0000 3287 008a 10c3
2013220 0000 031b 0000 315f 0026 6765 6e65 7269 635f 696e 7465 7266 6163 655f 636f 6e73 7461 6e74 5f64 6563 6c61 7261 7469 6f6e
2013300 0065 735d 000f ffbc 0000 0038 b27c b66c 0000 0922 0000 0918 000f ffc0 0200 0db5 0500 1cdd 0000 5b6f 0000 0013 0000 3287
2013360 008a 13a3 0000 031b 0000 315f 2954 002c 0002 438a 2520 46d8 332c 247c 0011 42b4 0014 3d00 56f8 4af8 0000 0ddf 671c 37dc
2013440 242c 0000 0011 4274 0010 00d0 0000 0038 b27c b66c 0000 0823 0000 0919 0010 00d4 0200 0db5 0500 1cdd 0000 5b77 0000 0013
2013520 0000 3287 008a 15a3 0000 031b 0000 315f 2c78 00dc 0002 438a 45e8 0028 46ec 2ba0 002c 0012 37c4 0028 31d4 0024 4a7c 0024
2013600 2c88 0018 2c58 37c4 0028 56f8 4b8c 0000 0000 1ff7 6af0 0024 bfcc 3410 0020 382c 0024 31f0 24d0 0000 0011 2f38 0024 3df4
2013660 0020 56f8 4b8c 0000 0000 0daf 6af0 001c 2ba0 0020 0010 37c4 001c 31bc 4a7c 0018 2c88 0016 2c58 37c4 001c 56f8 4b8c 0000
2013740 0000 24c7 6aa0 bfcc 33d8 3818 31f0 247c 0011 13ec 0018 2ba0 0018 000a 379c 4a7c 0010 723c 2c30 001c 379c 56f8 4b8c 0000
2014020 0000 0daf 55f0 4af8 0000 0df7 69b0 2c88 0014 2c58 3d0c 56f8 4b8c 0000 0000 0dd7 69b0 bfcc 2410 0000 0011 199c 0010 0148
2014100 0000 0038 b27c b66c 0000 0824 0000 091a 0010 014c 0200 0db5 0500 1cdd 0000 576f 0000 0013 0000 3287 0088 f683 0000 031b
2014160 0000 315f 2c78 0040 0002 438a 2520 46d8 56f8 4af8 0000 2397 55f0 4af8 0000 500f 55f0 4af8 0000 0a0f 671c 332c 24d0 0000
2014240 0011 42f4 0014 3d00 56f8 4af8 0000 0a7f 6d0c 723c 0010 01ac 0000 0038 b27c b66c 0000 0825 0000 091b 0010 01b0 0200 0db5
2014320 0500 1cdd 0000 586f 0000 0013 0000 3287 0089 3483 0000 031b 0000 315f 2c78 002c 0002 438a 45b8 46ec 2ba0 0014 0008 2330
2014400 0011 4354 2c30 000a 2410 0000 0011 4374 2c58 2330 0011 4394 0010 0249 0000 0070 b27c b66c 0000 0826 0000 091c 0010 01e8
2014460 0200 0db5 0500 1cdd 0000 5b8f 0000 0013 0000 3287 008a 1e83 0000 031b 0000 315f 0010 0248 0000 0038 b27c b66c 0000 0827
2014540 0000 091d 0010 024c 0200 0db5 0500 1cdd 0000 59e7 0000 0013 0000 3287 0089 a483 0000 031b 0000 315f 2c78 002c 0002 438a
2014620 2520 46d8 332c 247c 0011 4440 0014 3d00 56f8 4af8 0000 0daf 6750 3844 31f0 234c 0011 1a84 0010 02f8 0000 0070 b27c b66c
2014700 0000 0828 0000 091e 0010 0284 0200 0db5 0500 1cdd 0000 563f 0000 001b 0000 3287 0088 aee3 0000 031b 0000 315f 0010 02f8
2014760 0000 0038 b27c b66c 0000 0829 0000 091f 0010 02fc 0200 0db5 0500 1cdd 0000 5b9f 0000 0013 0000 3287 008a 2403 0000 031b
2015040 0000 315f 2954 0040 0002 438a 45dc 46ec 2ba0 001c 000e 37b0 31a4 4a7c 0014 2c88 000e 2c58 3348 3aa0 0011 1cdc 0018 3310
2015120 40f4 0000 0011 44c4 0014 37f0 3cf4 234c 0011 4480 0010 0360 0000 0038 b27c b66c 0000 082a 0000 0920 0010 0364 0200 0db5
2015200 0500 1cdd 0000 594f 0000 001b 0000 3287 0089 79c3 0000 031b 0000 315f 2954 0030 0002 438a 56f8 671c 682c 4754 33d8 247c
2015260 0011 15dc 0018 3d0c 56f8 4af8 0000 0abf 6750 3858 2420 0000 0011 2f38 0010 03fc 0000 0038 b27c b66c 0000 082b 0000 0921
2015340 0010 0400 0200 0db5 0500 1cdd 0000 5baf 0000 0013 0000 3287 008a 2c03 0000 031b 0000 315f 2c78 0064 0002 438a 2520 46ec
2015420 56f8 4af8 0000 2477 6750 3410 0020 32f0 001c 247c 0011 2b50 0024 3df4 0020 56f8 4b8c 0000 0000 538f 6aa0 411c 0000 001c
2015500 0011 45b0 001c 3348 3c48 0000 0011 25e8 0018 3310 40f4 0000 0011 45d0 0014 37f0 3cf4 234c 0011 45f0 0010 0488 0000 0038
2015560 b27c b66c 0000 082c 0000 0922 0010 048c 0200 0db5 0500 1cdd 0000 5bbf 0000 0013 0000 3287 008a 2e83 0000 031b 0000 315f
2015640 2954 0054 0002 438a 2520 46ec 56f8 4af8 0000 52a7 6750 3410 001c 32d4 24d0 0000 0011 2b50 0020 3df4 001c 56f8 4b8c 0000
2015720 0000 538f 6a50 40a0 0011 464c 0018 3310 3bf4 0000 0011 25e8 0014 37f0 3cf4 234c 0011 466c 0010 0914 0000 0438 b27c b66c
2016000 0000 0823 0000 0923 0010 5fa0 0200 0db5 0500 1cdd 0000 5bc7 0000 0013 0000 3287 008a 2f83 0000 031b 0000 315f 0010 0500
2016060 0000 0040 0011 699c 0011 682c 000c 06cd 0000 0000 0000 0000 0000 0000 0000 0000 0000 0000 0000 0000 0000 0000 0000 0000
2016140 0000 0000 0000 0000 000a dc9d 0010 05c0 0000 00c0 000b 1e75 0000 0000 0011 67d4 0000 0000 0000 0000 0000 0000 0000 0000
2016220 0000 0000 0000 0000 0011 67c4 0000 0000 0000 0000 0000 0000 0000 0000 000a 33a5 0000 0000 0000 0000 0000 0000 0011 695c
2016300 0000 0000 0011 67b4 0000 0000 0000 0000 0000 0000 0000 0000 0000 0000 0000 0000 0000 0000 0000 0000 0000 0000 0000 0000
2016360 0000 0000 0011 6288 0011 682c 0000 0000 0011 6784 0011 64d4 0011 6464 0011 65d0 0000 0000 0011 6228 0000 0000 0011 65e0
2016440 0000 0000 0000 0000 000a dc9d 0010 0914 0000 0300 0000 0000 0000 0000 0000 0000 0000 0000 0000 0000 0000 0000 0000 0000
2016520 0000 0000 0000 0000 0000 0000 0000 0000 0000 0000 0000 0000 0000 0000 0000 0000 0000 0000 0000 0000 0000 0000 0011 5c54
2016600 0011 5cbc 0011 5d10 0011 5d64 0000 0000 0000 0000 0011 4d70 0000 0000 0011 58ac 0011 50f8 0000 0000 0000 0000 0000 0000
2016660 0000 0000 0000 0000 0011 4b14 0000 0000 0000 0000 0011 67b4 0000 0000 0000 0000 0000 0000 0000 0000 0011 5690 0011 4244
2016740 0011 4284 0011 42c4 0000 0000 0000 0000 0011 43e0 0011 6288 0011 4490 0011 4dc0 0011 4590 0000 0000 0011 4600 0011 468c
```

```
2017020 0000 0000 0000 0000 0000 0000 0000 0000 0000 0000 0011 4760 0011 47ec 0011 483c 0011 489c 0000 0000 0011 4904 0011 4970
2017100 0011 49fc 0000 0000 0011 4b5c 0011 4bd4 000a 354d 0000 0000 0000 0000 0011 4c38 0011 4d28 0011 4fb0 0011 58bc 0011 5ed8
2017160 0011 53e0 0011 63dc 0011 4f90 0011 5004 0011 505c 0000 0000 0000 0000 0011 50e8 0011 5140 0011 51b8 0011 5250 0000 0000
2017240 0011 5354 0000 0000 0011 56a0 0011 68d4 0011 5518 0011 5598 0011 5588 0011 5660 0011 5650 0000 0000 000a 3019 0011 5f48
2017320 0011 57a8 0011 580c 0011 584c 0000 0000 0000 0000 0000 0000 0000 0000 0011 5994 0011 59f0 0011 6064 0000 0000 0011 5b28
2017400 0000 0000 0011 6104 0000 0000 0011 5cac 0011 51f4 0000 0000 0011 5ec8 0010 6241 0011 5fcc 0011 6014 000a e041 0011 61ac
2017460 0011 6180 0000 0000 0011 6278 0011 4cd8 0011 631c 0011 63ac 000a d75d 0011 6548 000b 1ead 0011 6538 0011 664c 0011 66f0
2017540 0011 6774 0011 635c 0000 0000 0000 0000 0011 6938 0011 699c 0000 0000 0011 67d4 0000 0000 0000 0000 0000 0000 0000 0000
2017620 0000 0000 0000 0000 0011 67c4 0000 0000 0000 0000 0011 598c 0000 0000 0000 0000 0000 0000 0000 0000 0000 0000 0000 0000
2017700 0000 0000 0000 0000 0000 0000 0000 0000 0000 0000 0000 0000 0011 5bbc 0000 0000 0011 42d4 0011 587c 0000 0000 0000 0000
2017760 0000 0000 0000 0000 0011 682c 0000 0000 0011 6784 0011 64d4 0011 6464 0011 65d0 0000 0000 0011 6228 0000 0000 0000 0000
2020040 0000 0000 0000 0000 0011 67fc 2c78 0054 0002 438a 2520 46d8 33d8 35c8 31f0 247c 0011 1a84 0018 3d0c 56f8 4af8 0000 3f5f
2020120 6a00 2ba0 0014 001a 3788 56f8 4b8c 0000 0000 0de7 55f0 4af8 0000 0e27 6d0c 723c 2c58 3788 56f8 4af8 0000 54c7 6d0c 723c
2020200 0010 0378 0000 0038 b27c b66c 0000 0832 0000 0928 0010 097c 0200 0db5 0500 1cdd 0000 5c07 0000 0013 0000 3287 008a 4163
2020260 0000 031b 0000 315f 2954 002c 0002 438a 2520 46d8 332c 247c 0011 47dc 0014 3d00 56f8 4af8 0000 0abf 671c 37dc 242c 0000
2020340 0011 482c 0010 0a18 0000 0038 b27c b66c 0000 0833 0000 0929 0010 0a1c 0200 0db5 0500 1cdd 0000 5c0f 0000 001b 0000 3287
2020420 008a 4463 0000 031b 0000 315f 2c78 0066 0002 438a 45d0 477c 3410 0020 329c 247c 0011 1b24 0024 3df4 0020 56f8 4b8c 0000
2020500 0000 0a0f 6750 3410 001c 3280 2410 0000 0011 3d44 0020 3df4 001c 56f8 4b8c 0000 0000 0a7f 6dd8 37dc 3ba0 0000 0011 48bc
2020560 0018 379c 5d10 0000 0200 523f 6d50 6d0c 723c 6572 0010 0a94 0000 0038 b27c b66c 0000 0834 0000 092a 0010 0a98 0200 0db5
2020640 0500 1cdd 0000 5c1f 0000 0013 0000 3287 008a 47a3 0000 031b 0000 315f 2c78 0044 0002 438a 45c4 46d8 2ba0 0014 0010 3844
2020720 37f0 31f0 242c 0000 0011 23f8 2c30 0012 3788 56f8 4b8c 0000 0000 531f 6d0c 723c 2c58 3788 56f8 4af8 0000 1ccf 6d0c 723c
2021000 0010 0d50 0000 00a8 b27c b66c 0000 0835 0000 092b 0010 0ad0 0200 0db5 0500 1cdd 0000 253f 0000 0013 0000 3287 0088 dec3
2021060 0000 031b 0000 315f 0010 0b04 0000 0038 b27c b66c 0000 0836 0000 092c 0010 0b08 0200 0db5 0500 1cdd 0000 5c27 0000 0013
2021140 0000 3287 008a 4b03 0000 031b 0000 315f 0010 0d50 0000 0038 b27c b66c 0000 0837 0000 092d 0010 0d54 0200 0db5 0500 1cdd
2021220 0000 5c2f 0000 0013 0000 3287 008a 4f63 0000 031b 0000 315f 2c78 0214 0002 438a 45e8 0030 4714 2ba0 0034 0012 37c4 0030
2021300 31d4 002c 4a7c 002c 2c88 0018 2c58 37c4 0030 56f8 4b8c 0000 0000 1ff7 6af0 002c bfcc 3410 0028 382c 002c 3280 24d0 0000
2021360 0011 2f38 002c 3df4 0028 56f8 4b8c 0000 0000 01af 6af0 0024 2ba0 0028 0012 37c4 0024 31d4 0020 4a7c 0020 2c88 0016 2c58
2021440 37c4 0024 56f8 4af8 0000 24c7 6af0 0020 bfcc 3410 001c 382c 0020 329c 24d0 0000 0011 13ec 0020 2ba0 0020 000e 37c4 001c
2021520 4a7c 0018 2c88 015c 2c30 001c 37c4 001c 56f8 4af8 0000 0daf 55f0 4af8 0000 0df7 6a50 2c88 0014 2c58 3df4 001c 56f8 4af8
2021600 0000 0dd7 6a50 bfcc 3880 3804 31f0 247c 0011 142c 0014 4538 4b8c 0000 0000 0373 5370 4550 4b8c 0000 0000 037b 6b74 4538
2021660 4b8c 0000 0000 034b 6bb4 4550 4b8c 0000 0000 03a3 6b74 4539 4b8c 0000 0000 030b 6bb4 4550 4b8c 0000 0000 03d3 6b74 4538
2021740 4b8c 0000 0000 034b 6bb4 4550 4b8c 0000 0000 0363 6b74 4538 4b8c 0000 0000 030b 6bb4 4550 4b8c 0000 0000 034b 6b74 4538
2022020 4b8c 0000 0000 03a3 6bb4 4550 4b8c 0000 0000 034b 6b74 4538 4b8c 0000 0000 0373 6bb4 4550 4b8c 0000 0000 034b 6b74 4538
2022100 4b8c 0000 0000 0103 6bb4 4550 4b8c 0000 0000 03a3 6b74 4538 4b8c 0000 0000 0373 6bb4 4550 4b8c 0000 0000 030b 6b74 4538
2022160 4b8c 0000 0000 03a3 6bb4 4550 4b8c 0000 0000 039b 6b74 4538 4b8c 0000 0000 0373 6bb4 4550 4b8c 0000 0000 037b 6b74 4538
2022240 4b8c 0000 0000 031b 6bb4 247c 0011 3abc 0014 3d30 3cf4 234c 0011 4a1c 0010 0db4 0000 0038 b27c b66c 0000 0838 0000 092e
2022320 0010 0db8 0200 0db5 0500 1cdd 0000 5997 0000 0013 0000 3287 0089 8ec3 0000 031b 0000 315f 2c78 002c 0002 438a 45b8 46ec
2022400 2ba0 0014 0008 2330 0011 49ec 2c30 000a 2410 0000 0011 4a90 2c58 2330 0011 4ab0 0010 0e50 0000 0070 b27c b66c 0000 0839
2022460 0000 092f 0010 0df0 0200 0db5 0500 1cdd 0000 5c4f 0000 0013 0000 3287 008a 5723 0000 031b 0000 315f 0010 0e50 0000 0038
2022540 b27c b66c 0000 083a 0000 0930 0010 0e54 0200 0db5 0500 1cdd 0000 5b1f 0000 0013 0000 3287 008a 0163 0000 031b 0000 315f
2022620 2954 002c 0002 438a 2520 46d8 332c 247c 0011 4ae4 0014 3d00 56f8 4af8 0000 0ddf 671c 37dc 242c 0000 0011 402c 0010 117c
2022700 0000 0038 b27c b66c 0000 083b 0000 0931 0010 1180 0200 0db5 0500 1cdd 0000 5c3f 0000 0013 0000 3287 008a 5483 0000 031b
2022760 0000 315f 2c78 02f4 0002 438a 45e8 0038 4728 001c 2ba0 003c 0012 37c4 0038 31d4 0034 4a7c 0034 2c88 0016 2c58 37c4 0038
2023040 56f8 4af8 0000 537f 6af0 0034 bfcc 3410 0030 392c 0034 3280 24d0 0000 0011 2f38 0034 3df4 0030 56f8 4b8c 0000 0000 0daf
2023120 6af0 002c 2ba0 0030 001c 329c 4e1c 0000 0000 24c7 37c4 002c 31d4 0028 4a7c 0028 2c88 0018 2c58 3410 0028 382c 002c 329c
2023200 24d0 0000 0011 4b7c 002c 3410 0024 3e70 0028 32b8 24d0 0000 0011 13ec 0028 2ba0 0028 0012 37c4 0024 31d4 0020 4a7c 0020
2023260 2c88 00d0 2c58 3df4 0024 56f8 4b8c 0000 0000 526f 6af0 0020 4538 4af8 0000 0373 5370 4550 4b8c 0000 0000 037b 6b74 4538
2023340 4b8c 0000 0000 034b 6bb4 4550 4b8c 0000 0000 03a3 6b74 4538 4b8c 0000 0000 030b 6bb4 4550 4b8c 0000 0000 0393 6b74 4538
2023420 4b8c 0000 0000 030b 6bb4 4550 4b8c 0000 0000 0363 6b74 4539 4b8c 0000 0000 031b 6bb4 4550 4b8c 0000 0000 032b 6b74 4538
2023500 4b8c 0000 0000 0323 6bb4 4550 4b8c 0000 0000 0103 6b74 4538 4b8c 0000 0000 039b 6bb4 4550 4b8c 0000 0000 03ab 6b74 4538
2023560 4b8c 0000 0000 0313 6bb4 247c 0011 3abc 0024 2ba0 0024 000e 37c4 0020 4a7c 001c 2c88 0148 2c30 001c 37c4 0020 56f8 4af8
2023640 0000 0daf 55f0 4af8 0000 0df7 6aa0 2c88 0014 2c58 37c4 0020 56f8 4af8 0000 0dd7 6aa0 bfcc 3894 001c 3818 31f0 24d0 0000
2023720 0011 142c 0018 4538 4b8c 0000 0000 0373 5370 4550 4b8c 0000 0000 037b 6b74 4538 4b8c 0000 0000 034b 6bb4 4550 4b8c 0000
2024000 0000 03a3 6b74 4538 4b8c 0000 0000 030b 6bb4 4550 4b8c 0000 0000 03d3 6b74 4538 4b8c 0000 0000 034b 6bb4 4550 4b8c 0000
2024060 0000 0363 6b74 4538 4b8c 0000 0000 030b 6bb4 4550 4b8c 0000 0000 034b 6b74 4538 4b8c 0000 0000 03a3 6bb4 4550 4b8c 0000
```

| | | | | | | | | | | | | | | | | | | | | | | | |
|---|---|---|---|---|---|---|---|---|---|---|---|---|---|---|---|---|---|---|---|---|---|---|---|
| 2024140 | 0000 | 034b | 6b74 | 4538 | 4b8c | 0000 | 0000 | 0373 | 6bb4 | 4550 | 4b8c | 0000 | 0000 | 034b | 6b74 | 4538 | 4b8c | 0000 | 0000 | 0103 | 6bb4 | 4550 | 4b8c | 0000 |
| 2024220 | 0000 | 0363 | 6b74 | 4538 | 4b8c | 0000 | 0000 | 030b | 6bb4 | 4550 | 4b8c | 0000 | 0000 | 0373 | 6b74 | 4538 | 4b8c | 0000 | 0000 | 033b | 6bb4 | 4550 | 4b8c | 0000 |
| 2024300 | 0000 | 034b | 6b74 | 4538 | 4b8c | 0000 | 0000 | 039b | 6bb4 | 247c | 0011 | 3abc | 0018 | 3d6c | 3d30 | 3cf4 | 242c | 0000 | 0011 | 4b9c | 0010 | 13dc | 0000 | 0038 |
| 2024360 | b27c | b66c | 0000 | 083c | 0000 | 0932 | 0010 | 13e0 | 0200 | 0db5 | 0500 | 1cdd | 0000 | 5c47 | 0000 | 0013 | 0000 | 3287 | 008a | 5583 | 0000 | 031b | 0000 | 315f |
| 2024440 | 2c78 | 0228 | 0002 | 438a | 45e8 | 0034 | 4728 | 001c | 2ba0 | 0038 | 0012 | 37c4 | 0034 | 31d4 | 0030 | 4a7c | 0030 | 2c88 | 0016 | 2c58 | 37c4 | 0034 | 56f8 | 4af8 |
| 2024520 | 0000 | 32e7 | 6af0 | 0030 | bfcc | 3410 | 002c | 382c | 0030 | 3280 | 24d0 | 0000 | 0011 | 2f38 | 0030 | 3df4 | 002c | 56f8 | 4b8c | 0000 | 0000 | 0daf | 6af0 | 0028 |
| 2024600 | 2ba0 | 002c | 001c | 329c | 4e1c | 0000 | 0000 | 24c7 | 37c4 | 0028 | 31d4 | 0024 | 4a7c | 0024 | 2c88 | 0018 | 2c58 | 3410 | 0024 | 382c | 0028 | 329c | 24d0 | 0000 |
| 2024660 | 0011 | 4b7c | 0028 | 3410 | 0020 | 3e70 | 0024 | 32b8 | 24d0 | 0000 | 0011 | 13ec | 0024 | 2ba0 | 0024 | 000e | 37c4 | 0020 | 4a7c | 001c | 2c88 | 0160 | 2c30 | 001c |
| 2024740 | 37c4 | 0020 | 56f8 | 4af8 | 0000 | 0daf | 55f0 | 4af8 | 0000 | 0df7 | 6aa0 | 2c88 | 0014 | 2c58 | 3df4 | 0020 | 56f8 | 4af8 | 0000 | 0dd7 | 6aa0 | bfcc | 3894 | 001c |
| 2025020 | 3818 | 31f0 | 24d0 | 0000 | 0011 | 142c | 0018 | 4538 | 4b8c | 0000 | 0000 | 0373 | 5370 | 4550 | 4b8c | 0000 | 0000 | 037b | 6b74 | 4538 | 4b8c | 0000 | 0000 | 034b |
| 2025100 | 6bb4 | 4550 | 4b8c | 0000 | 0000 | 03a3 | 6b74 | 4538 | 4b8c | 0000 | 0000 | 030b | 6bb4 | 4550 | 4b8c | 0000 | 0000 | 03d3 | 6b74 | 4538 | 4b8c | 0000 | 0000 | 034b |
| 2025160 | 6bb4 | 4550 | 4b8c | 0000 | 0000 | 0363 | 6b74 | 4538 | 4b8c | 0000 | 0000 | 030b | 6bb4 | 4550 | 4b8c | 0000 | 0000 | 034b | 6b74 | 4538 | 4b8c | 0000 | 0000 | 03a3 |
| 2025240 | 6bb4 | 4550 | 4b8c | 0000 | 0000 | 034b | 6b74 | 4538 | 4b8c | 0000 | 0000 | 0373 | 6bb4 | 4550 | 4b8c | 0000 | 0000 | 034b | 6b74 | 4538 | 4b8c | 0000 | 0000 | 0103 |
| 2025320 | 6bb4 | 4550 | 4b8c | 0000 | 0000 | 032b | 6b74 | 4538 | 4b8c | 0000 | 0000 | 0363 | 6bb4 | 4550 | 4b8c | 0000 | 0000 | 0313 | 6b74 | 4538 | 4b8c | 0000 | 0000 | 030b |
| 2025400 | 6bb4 | 4550 | 4b8c | 0000 | 0000 | 034b | 6b74 | 4538 | 4b8c | 0000 | 0000 | 0393 | 6bb4 | 4550 | 4b8c | 0000 | 0000 | 030b | 6b74 | 4538 | 4b8c | 0000 | 0000 | 03b3 |
| 2025460 | 6bb4 | 247c | 0011 | 3abc | 0018 | 3d6c | 3d30 | 3cf4 | 242c | 0000 | 0011 | 4bf4 | 0010 | 14b4 | 0000 | 00a8 | b27c | b66c | 0000 | 083d | 0000 | 0933 | 0010 | 1418 |
| 2025540 | 0200 | 0db5 | 0500 | 1cdd | 0000 | 5c67 | 0000 | 001b | 0000 | 3287 | 008a | 6143 | 0000 | 031b | 0000 | 315f | 0010 | 144c | 0000 | 0038 | b27c | b66c | 0000 | 083e |
| 2025620 | 0000 | 0934 | 0010 | 1450 | 0200 | 0db5 | 0500 | 1cdd | 0000 | 2627 | 0000 | 001b | 0000 | 3287 | 0089 | 1fc3 | 0000 | 031b | 0000 | 315f | 0010 | 14b4 | 0000 | 0038 |
| 2025700 | b27c | b66c | 0000 | 083f | 0000 | 0935 | 0010 | 14b8 | 0200 | 0db5 | 0500 | 1cdd | 0000 | 5c6f | 0000 | 001b | 0000 | 3287 | 008a | 68c3 | 0000 | 031b | 0000 | 315f |
| 2025760 | 2954 | 0030 | 0002 | 438a | 56f8 | 671c | 682c | 4754 | 33d8 | 247c | 0011 | 23f8 | 0018 | 3d0c | 56f8 | 4af8 | 0000 | 0abf | 6750 | 3858 | 2420 | 0000 | 0011 | 4d18 |
| 2026040 | 0010 | 158c | 0000 | 00a8 | b27c | b66c | 0000 | 0840 | 0000 | 0936 | 0010 | 14f0 | 0200 | 0db5 | 0500 | 1cdd | 0000 | 5ad7 | 0000 | 0013 | 0000 | 3287 | 0089 | ede3 |
| 2026120 | 0000 | 031b | 0000 | 315f | 0010 | 1524 | 0000 | 0038 | b27c | b66c | 0000 | 0841 | 0000 | 0937 | 0010 | 1528 | 0200 | 0db5 | 0500 | 1cdd | 0000 | 5ba7 | 0000 | 0013 |
| 2026200 | 0000 | 3287 | 008a | 2623 | 0000 | 031b | 0000 | 315f | 0010 | 158c | 0000 | 0038 | b27c | b66c | 0000 | 0842 | 0000 | 0938 | 0010 | 1590 | 0200 | 0db5 | 0500 | 1cdd |
| 2026260 | 0000 | 597f | 0000 | 0013 | 0000 | 3287 | 0089 | 8743 | 0000 | 031b | 0000 | 315f | 2c78 | 0030 | 0002 | 438a | 2520 | 46d8 | 56f8 | 4af8 | 0000 | 2677 | 671c | 332c |
| 2026340 | 24d0 | 0000 | 0011 | 4e24 | 0014 | 3d00 | 56f8 | 4af8 | 0000 | 0ddf | 6d0c | 723c | 0010 | 1658 | 0000 | 0070 | b27c | b66c | 0000 | 0843 | 0000 | 0939 | 0010 | 15c8 |
| 2026420 | 0200 | 0db5 | 0500 | 1cdd | 0000 | 59bf | 0000 | 0013 | 0000 | 3287 | 0089 | 9843 | 0000 | 031b | 0000 | 315f | 0010 | 1658 | 0000 | 0038 | b27c | b66c | 0000 | 0844 |
| 2026500 | 0000 | 093a | 0010 | 165c | 0200 | 0db5 | 0500 | 1cdd | 0000 | 544f | 0000 | 0013 | 0000 | 3287 | 008a | 7803 | 0000 | 031b | 0000 | 315f | 2c78 | 005c | 0002 | 438a |
| 2026560 | 45c4 | 46d3 | 2ba0 | 0014 | 000c | 37dc | 3788 | 234c | 0011 | 4f30 | 2c30 | 000e | 37dc | 3788 | 242c | 0000 | 0011 | 3af4 | 2c30 | 000e | 37dc | 3788 | 242c | 0000 |
| 2026640 | 0011 | 4f50 | 2c30 | 000e | 37dc | 3788 | 242c | 0000 | 0011 | 1f28 | 2c58 | 3788 | 56f8 | 4af8 | 0000 | 5307 | 6d0c | 723c | 0010 | 16f4 | 0000 | 0070 | b27c | b66c |
| 2026720 | 0000 | 0845 | 0000 | 093b | 0010 | 1694 | 0200 | 0db5 | 0500 | 1cdd | 0000 | 5c9f | 0000 | 0013 | 0000 | 3287 | 008a | 7c03 | 0000 | 031b | 0000 | 315f | 0010 | 16f4 |
| 2027000 | 0000 | 0038 | b27c | b66c | 0000 | 0846 | 0000 | 093c | 0010 | 16f8 | 0200 | 0db5 | 0500 | 1cdd | 0000 | 5c77 | 0000 | 0013 | 0000 | 3287 | 008a | 7123 | 0000 | 031b |
| 2027060 | 0000 | 315f | 2954 | 002c | 0002 | 438a | 2520 | 46d8 | 332c | 247c | 0011 | 4f80 | 0014 | 3d00 | 56f8 | 4af8 | 0000 | 0abf | 671c | 37dc | 242c | 0000 | 0011 | 4e24 |
| 2027140 | 0010 | 17c4 | 0000 | 0038 | b27c | b66c | 0000 | 0847 | 0000 | 093d | 0010 | 17c8 | 0200 | 0db5 | 0500 | 1cdd | 0000 | 5ca7 | 0000 | 0013 | 0000 | 3287 | 008a | 7fa3 |
| 2027220 | 0000 | 031b | 0000 | 315f | 2c78 | 006c | 0002 | 438a | 45c4 | 46d8 | 2ba0 | 0014 | 0010 | 3788 | 56f8 | 4af8 | 0000 | 522f | 6d0c | 723c | 2c30 | 0012 | 3788 | 56f8 |
| 2027300 | 4b8c | 0000 | 0000 | 5317 | 6d0c | 723c | 2c30 | 0012 | 3788 | 56f8 | 4b8c | 0000 | 0000 | 52f7 | 6d0c | 723c | 2c30 | 0012 | 3788 | 56f8 | 4b8c | 0000 | 0000 | 52ff |
| 2027360 | 6d0c | 723c | 2c58 | 3788 | 56f8 | 4af8 | 0000 | 531f | 6d0c | 723c | 0029 | 7075 | 7464 | 625f | 6974 | 6572 | 6174 | 696f | 6e5f | 7363 | 6865 | 6d65 | 5f61 | 6e64 |
| 2027440 | 5f6c | 6f6f | 705f | 7374 | 6174 | 656d | 656e | 7400 | 0010 | 1e34 | 0000 | 0038 | b27c | b66c | 0000 | 0848 | 0000 | 093e | 000f | db74 | 0200 | 0db5 | 0500 | 1cdd |
| 2027520 | 0000 | 5caf | 0000 | 0013 | 0000 | 3287 | 008a | 8263 | 0000 | 031b | 0000 | 315f | 2c78 | 0030 | 0002 | 438a | 2520 | 46d8 | 56f8 | 4af8 | 0000 | 53bf | 671c | 332c |
| 2027600 | 24d0 | 0000 | 0011 | 681c | 0014 | 3d00 | 56f8 | 4af8 | 0000 | 01df | 6d0c | 723c | 0001 | 2000 | 0010 | a5e0 | 0010 | 3304 | 0012 | 5318 | 0000 | 0000 | 001a | 2240 |
| 2027660 | 2823 | 2938 | 382f | 3131 | 2f30 | 3220 | 6d73 | 742e | 706c | 0932 | 372e | 3422 | 0000 | 0000 | 000f | bbec | 0100 | 2def | 0000 | 4dbf | 0000 | 0004 | 0010 | 18a4 |
| 2027740 | 0010 | 18a4 | 0001 | 005c | 0000 | 0000 | 0000 | 0028 | 000f | bc14 | b27c | b66c | 0000 | 0689 | 7fff | ffff | 0010 | a530 | 0200 | 0db5 | 0100 | 32b5 | 0000 | 4dbf |
| 2030020 | 0000 | 315f | 2cac | 0000 | 0002 | 438a | 2ca0 | 0000 | 0000 | 0000 | 0000 | 0001 | 000c | f2b8 | 000c | f2b8 | 0002 | 438a | 0010 | 18c8 | 000c | f2c4 | 0012 | 9a28 |
| 2030100 | 000f | 9680 | 0011 | 5bbc | 0011 | 5cbc | 0008 | e5cc | 0500 | 5047 | 0000 | 4dbf | 0000 | 0014 | 0010 | 19b8 | 0010 | 19b8 | 0001 | 005c | 0000 | 0000 | 0008 | e64c |
| 2030160 | 0300 | 5057 | 0000 | 4dbf | 0000 | 000c | 0010 | 191c | 0010 | 191c | 0001 | 005c | 0000 | 0000 | 2cac | 0000 | 0002 | 438a | 2ca0 | 0000 | 0000 | 0000 | 0000 | 0001 |
| 2030240 | 000f | d1f4 | 000d | ada0 | 000d | adaa | 000f | d21c | 0008 | e6cc | 0400 | 506f | 0000 | 4dbf | 0000 | 0010 | 0010 | 1aec | 0010 | 1aec | 0001 | 005c | 0000 | 0000 |
| 2030320 | 0008 | e68c | 0400 | 505f | 0000 | 4dbf | 0000 | 0010 | 0010 | 1c54 | 0010 | 1c54 | 0001 | 005c | 0000 | 0000 | 000f | f7bc | 0400 | 503f | 0000 | 3287 | 0000 | 0010 |
| 2030400 | 0010 | 1cc0 | 0010 | 1cc0 | 0041 | 0000 | 0000 | 0000 | 27f0 | 0016 | 000d | ae5c | 4e1c | 0000 | 0000 | 0007 | 4a48 | 0018 | 228c | 0000 | 2cac | 0000 | 0002 | 438a |
| 2030460 | 2ca0 | 0000 | 0000 | 0000 | 0000 | 0001 | 0010 | 19a0 | 000d | ae5c | 000d | ae66 | 0010 | 19dc | 0010 | 19ac | 0008 | bb0c | 0400 | 504f | 0000 | 4dbf | 0000 | 0010 |
| 2030540 | 0010 | 1a00 | 0010 | 1a48 | 0001 | 005c | 0000 | 0000 | 27f0 | 0012 | 0010 | 1a14 | 4960 | 4d6c | 0000 | 0003 | 2edc | 0000 | 28c4 | 0014 | 0010 | 1a28 | 2520 | 247c |
| 2030620 | 0008 | b6fc | 000c | 2eb0 | 28c4 | 0020 | 0010 | 1a48 | 3724 | 0018 | 2520 | 3640 | 3614 | 0018 | 24d0 | 0000 | 0008 | b6fc | 000c | 2eb0 | 2954 | 0012 | 0002 | 438a |
| 2030700 | 4f18 | 0000 | 0000 | 5077 | 228c | 0000 | 0010 | 1940 | 0200 | 506f | 0000 | 4dbf | 0000 | 0008 | 0010 | 1ab0 | 0010 | 1ab0 | 0001 | 005c | 0000 | 0000 | 0010 | 83fc |
| 2030760 | 000c | aeac | 0005 | 7265 | 6665 | 7200 | 2c78 | 0024 | 0002 | 438a | 56f8 | 6580 | 0018 | 36a4 | 4568 | 6c84 | 0018 | 5370 | 3614 | 0018 | 239c | 0000 | 0010 | 1950 |
| 2031040 | 2cac | 0000 | 0002 | 438a | 2ca0 | 0000 | 0000 | 0000 | 0000 | 0000 | 0010 | 1a8c | 0010 | 1a8c | 0010 | 1a96 | 0010 | 1ad4 | 0000 | 0000 | 27f0 | 0014 | 000d | af58 |
| 2031120 | 4e1c | 0000 | 0000 | 0007 | 49c8 | 228c | 2cac | 0000 | 0002 | 438a | 2ca0 | 0000 | 0000 | 0000 | 0000 | 0001 | 0010 | 1ad8 | 000d | af58 | 000d | af62 | 0010 | 1b10 |
| 2031200 | 0010 | 1ae4 | 000f | 636f | 6d70 | 6172 | 655f | 7472 | 6970 | 6c65 | 7300 | 0000 | ffff | ffff | 0300 | 507f | 0000 | 4dbf | 0000 | 000c | 0010 | 1b70 | 0010 | 1b70 |

```
2031260  0001 005c 0000 0000 0010 1a5c 0600 506f 0000 4dbf 0000 0019 0010 1bb4 0010 1bb4 0001 005c 00c0 0000 000a 3d98 0000 0000
2031340  2c78 0028 0002 438a 5d7c 0000 0300 0e4f 5f8c 6750 5de8 0000 0300 0e4f 5f8c 6784 239c 0000 0008 b97c 27f0 001c 0010 1bdc
2031420  4e1c 0000 0000 0e27 35b0 001c 239c 0000 0010 1950 2cac 0000 0002 438a 2ca0 0000 0000 000c 0000 0003 0010 1b98 0010 1c18
2031500  0002 438a 000f c3a8 0010 1c4c 28c4 0024 0010 1c18 4e1c 0000 0000 0de7 3614 0018 35b0 001c 4568 6b88 5370 22bc 0010 1950
2031560  006e 47ec 0000 0000 0010 1ba4 0000 0000 0010 1be8 0010 1c08 2954 0028 0002 438a 4e1c 0000 0000 0df7 3724 0020 35b0 001c
2031640  4568 6c48 0018 6c48 0020 22bc 0010 1950 27f0 0014 000d b084 4e1c 0000 0000 0007 5548 228c 2cac 0000 0002 438a 2ca0 0000
2031720  0000 0000 0000 0001 0010 1c40 0010 1c78 000f 9a54 0010 1bd8 2954 001c 0002 438a 56f8 6580 0018 5818 6c84 0018 67b8 22bc
2032000  0010 1970 27f0 0014 000f d990 4e1c 0000 0000 0007 49c8 228c 2954 0014 0002 438a 5758 5fa0 6750 22bc 0010 1e00 0010 3ecc
2032060  2c78 0028 0002 438a 370c 0018 44a0 0000 0200 01af 4b8c 0000 0000 3287 6c48 0018 239c 0000 000f f7cc 000f f7dc 0400 4dbf
2032140  0000 3287 0000 0010 0010 1d08 0010 1d08 0041 0000 0000 0000 2c78 0028 0002 438a 370c 0018 44a0 0000 0200 0daf 4b8c 0000
2032220  0000 3287 6c48 0018 239c 0000 000f f7ec 0008 e70c 0300 509f 0000 3287 0000 000c 0010 1d50 0010 1d50 0001 005d 0000 0000
2032300  2c78 0020 0002 438a 36f4 0018 36b8 437c 4538 6c48 0018 5370 239c 0000 0010 1d80 0010 1d30 0400 509f 0000 3287 0000 0010
2032360  0010 1d90 0010 1d90 0001 005d 0000 0000 2cac 0000 0002 438a 2ca0 0000 0000 0000 0000 0001 0010 1c94 000f d990 000f d99a
2032440  0010 1db4 0010 1ca0 0012 6e65 775f 6672 6f6e 7469 6572 5f6e 6f64 6573 0000 0000 000f 9794 0300 4eaf 0000 3287 0000 000c
2032520  0011 5a98 0011 5a98 0041 0000 0000 0000 0008 e72c 0500 50a7 0000 3287 0000 0014 000f c640 0010 1ca8 0001 005d 0000 0000
2032600  000f 9128 0300 4ea7 0000 3287 0000 000c 0011 5d64 0011 5d64 0041 0000 0000 0000 0010 3214 0000 002c b288 b66c 0000 06cf
2032660  7fff ffff 0010 4248 0200 0db5 0100 15ad 0100 33f1 0000 000b 0000 315f 003c 2f68 6f6d 652f 6f73 6173 312f 612f 7669 6a61
2032740  792f 5648 444c 2f70 6172 7365 722f 7072 6f6c 6f67 2f6e 6577 6e65 772f 7633 2e31 2f72 6561 6463 6f6e 7374 006c 003f 2f68
2033020  6f6d 652f 6f73 6173 312f 612f 7669 6a61 792f 5648 444c 2f70 6172 7365 722f 7072 6f6c 6f67 2f6e 6577 6e65 772f 7633 2e31
2033100  2f72 6561 6463 6f6e 7374 2e70 6c00 6574 0000 002c 000a 2e18 b27c b66c 0000 06d2 7fff ffff 000f f8e4 0200 0db5 0200 2f35
2033160  0000 5107 0000 02fb 0000 315f 0000 002c 0010 4418 b27c b66c 0000 0719 7fff ffff 000a 2e70 0200 0db5 0200 224d 0000 5107
2033240  0000 510f 0000 315f 27f0 0012 0010 aaa0 4e1c 0300 0000 4bcf 228c 0000 0000 002c 000d a839 b27c b66c 0000 071a 7fff ffff
2033320  000a 29fc 0200 0db5 0200 24bd 0000 3287 0000 510f 0000 315f 0000 002c 000d a85c b27c b66c 0000 06d6 7fff ffff 000a 2edc
2033400  0200 0db5 0200 294d 0000 510f 0000 5107 0000 315f 0000 0034 000d a8bc b27c b66c 0000 06d7 7fff ffff 0010 1fe0 0200 0db5
2033460  0400 242d 0000 5117 0000 0013 0000 510f 0000 21cf 0000 315f 0000 0034 0010 1fac b27c b66c 0000 06d8 7fff ffff 0010 2014
2033540  0200 0db5 0400 242d 0000 511f 0000 0013 0000 510f 0000 21cf 0000 315f 0000 0034 0010 1fe0 b27c b66c 0000 06d9 7fff ffff
2033620  0010 2048 0200 0db5 0400 242d 0000 510f 0000 000b 0000 510f 0000 21cf 0000 315f 0000 0034 0010 2014 b27c b66c 0000 06da
2033700  7fff ffff 0010 207c 0200 0db5 0400 242d 0000 510f 0000 0013 0000 510f 0000 21cf 0000 315f 0000 0034 0010 2048 b27c b66c
2033760  0000 06db 7fff ffff 0010 20b0 0200 0db5 0400 242d 0000 5127 0000 000b 0000 510f 0000 21cf 0000 315f 0000 0034 0010 207c
2034040  b27c b66c 0000 06dc 7fff ffff 0010 20e4 0200 0db5 0400 242d 0000 5127 0000 0013 0000 510f 0000 21cf 0000 315f 0000 0034
2034120  0010 20b0 b27c b66c 0000 06dd 7fff ffff 000a 2758 0200 0db5 0400 242d 0000 512f 0000 0003 0000 510f 0000 21cf 0000 315f
2034200  000c 8e4d 000c aee5 000a 38f8 0000 0000 0000 0000 000a 3918 000c af38 000a 3928 000a 3938 000a 3948 000a 2fdc 000a 3958
2034260  000a 3978 000a 3998 000a 39b8 0000 0000 0000 0000 000a 39c8 000a 39e8 0000 0000 0000 0000 000a 3a08 0000 0000 0000 0000
2034340  0000 0000 0000 0000 0000 0000 0000 0000 0000 0000 0000 0000 000a 3a38 0000 0000 0000 0000 0000 0000 0000 0000 000a 3a68
2034420  0000 0000 0000 0000 0000 0000 0000 0000 0000 0000 0000 0000 0000 0000 0000 0000 0000 0000 0000 0000 000a 3aa8 000a 3ac8
2034500  000a 3ae8 0000 0000 0000 0000 0000 0000 0000 0000 0000 0000 0000 0000 000a 3b48 000a 3b58 0000 0000 0000 0000 0000 0000
2034560  0000 0000 000a 3b68 0000 0000 0000 0000 0000 0000 0000 0000 0000 0000 0000 0000 0000 0000 000a 3b78 0000 0000 0000 0000
2034640  0000 0000 0000 0000 000a 3ba8 000a 3bb8 0000 0000 0000 0000 0000 0000 0000 0000 000a 3bc8 0000 0000 0000 0000 000a 3be8
2034720  0000 0000 000a 3c08 0000 0000 0000 0000 0000 0000 0000 0000 0000 0000 0000 0000 0000 0000 0000 0000 000a 3028 0000 0000
2035000  0000 0000 0000 0000 0000 0000 000a 3c28 0000 0000 0000 0000 0000 0000 0000 0000 000a 3c38 0000 0000 000a 3c48 0000 0000
2035060  0000 0000 0000 0000 0000 0000 0000 0000 000a 3c58 0000 0000 000a d944 0000 0000 000a 3044 000a 3060 0000 0000 0000 0000
2035140  0000 0000 000a 3c68 000a 3c78 000a 3c88 0000 0000 0000 0000 0000 0000 0000 0000 0000 0000 000a 3c98 0000 0000 0000 0000
2035220  000a 3ca8 0000 0000 0000 0000 0000 0000 000a 307c 0000 0000 0000 0000 0000 0000 0000 0000 0000 0000 0000 0000 0000 0000
2035300  0000 0000 0000 0000 0000 0000 0000 0000 0000 0000 0000 0000 0000 0000 0000 0000 0000 0000 0000 0000 0000 0000 000a 3cb8
2035360  0000 0000 0000 0000 0000 0000 0000 0000 0000 0000 0000 0000 0000 0000 0000 0000 000a 3cc8 0000 0000 0000 0000 000a 3cd8
2035440  0000 0000 0000 0000 0000 0000 000a 3ce8 0000 0000 0000 0000 0000 0000 0000 0000 0000 0000 0000 0000 0000 0000 0000 0000
2035520  0000 0000 0000 0000 0000 0000 0019 7140 0019 7170 0019 71a0 0019 25c1 0019 7200 0019 7230 0000 0000 0000 0000 0000 0000
2035600  0000 0000 0000 0000 000a 3d08 000a 3d18 0000 0000 0000 0000 000a 3d28 0000 0000 0000 0000 0000 0000 000a 3d38 0000 0000
2035660  0000 0000 0000 0000 0000 0000 000a 3d48 000a 3d58 000a 3d68 0000 0000 0000 0000 0000 0000 0000 0000 0000 0000 000a 3098
2035740  0000 0000 0000 0000 0000 0000 000a 30b4 0000 0000 0000 0000 0000 0000 0000 0000 0000 0000 0000 0000 0000 0000 0000 0000
2036020  000a 3d78 0000 0000 0000 0000 0017 cc18 0000 0000 0000 0000 0000 0000 000a 30d0 0000 0000 0000 0000 0000 0000 0000 0000
2036100  0000 0000 000a 3da8 0000 0000 0000 0000 0000 0000 000c eab4 000c ea30 000c ea78 000c ea68 000d 1855 000c ae7c 000c b0b4
2036160  000d 4578 000d 45c8 000d 4618 000d 4678 000d 46a8 000d 46d8 000d 4721 000d 4748 000d 4791 000d 47b8 000d 4808 000d 4851
2036240  000d 4878 000d 48a8 000d 48d8 000d 4908 000d 4938 000d 4968 0000 0000 0000 0000 0000 0000 000a 31f8 000a 3e08 0000 0000
2036320  000a 357c 000a 3e18 000a 3e28 000a 3e38 000d 7319 000d 7769 000d 7439 000d 7441 000d a525 000d a54d 000d a595 000d a5dd
```

```
2036400  000d a605 000d a62d 000d a695 000d a6bd 000d a6e5 000d 6f6c 000d 6ff0 000d 6f3c 0000 0000 000a 3768 000a 3fa8 000a 3fb8
2036460  0000 0000 000a 373c 000a 3fc8 0000 0000 000a 3108 000d ce34 000d cda4 0000 0000 0000 0000 0000 0000 0000 0000 000d c891
2036540  000d 2c61 000a 3ff8 000a 4008 000a 4018 0000 0000 0000 0000 0000 0000 0000 0000 000a 4028 0000 0000 0000 0000 0000 0000
2036620  000a 4038 000a 4048 0000 0000 000a da85 000b 2385 0012 7f1c 000a 4068 000a 4078 000a 4088 000d cf38 000e 4155 000e 417c
2036700  000e 41bc 000e 41ec 000e 421c 000e 424c 000e 428c 000e 42ec 000e 434c 000a 4098 0000 0000 0000 0000 000a 40a8 0000 0000
2036760  000a 3491 000a 40d8 0000 0000 0000 0000 000a 40e8 000e 46b4 000e 45f0 000e 45bc 000e 458c 0000 0000 000d 4648 0000 0000
2037040  000a 3124 0000 0000 0000 0000 000a 40f8 0000 0000 000a 4108 000a 4118 0000 0000 0000 0000 0000 0000 0000 0000 000e 44e4
2037120  000e 44b4 000e 7629 000e 7650 000e 7680 000e 76b0 000e 76f9 000e 7720 000e 7769 000e 7790 000e 77c0 000e 77f0 000e 7839
2037200  000e 7879 000e 78b9 000e 78e0 000e 7929 000e 7969 000e 7990 000e 79d1 000e 7a09 000e 7a41 000e 7a68 000e 7aa8 000e 7ae8
2037260  000e 7b28 000e 7b68 000e 7b98 000e 7bc8 000e 7c08 000e 7c68 000e 7c98 000e 7cc8 000e 7d28 000e 7d78 000e 7dc8 000e 7e18
2037340  000e 7e68 000e 7ed1 0015 a781 000e 7f99 000e 7fc0 000e 8001 0000 0000 0000 0000 0000 0000 000a 41f8 000a 4208 000a 4218
2037420  000a 4228 0000 0000 0000 0000 000a 4248 0000 0000 000a 4268 0000 0000 000a 31c0 0000 0000 0000 0000 000a 4288 0000 0000
2037500  000a 4298 0000 0000 0000 0000 000a 42c8 0000 0000 000a 42e8 000a 3498 000f cf58 0000 0000 000a 31fc 0000 0000 000a 3481
2037560  000a 4318 0000 0000 000a 4338 000a 4348 000e 81dd 000e 80a1 000e 8521 000b 304d 000f 5ed9 000f 5f01 000f 5f31 000f 5f58
2037640  000f 5fa1 000f 5fc8 000f 6009 000f 6041 0014 5475 0014 54a1 0014 54e5 0014 551d 0014 557d 0014 55bd 0014 5615 0014 565c
2037720  0014 56bd 0014 5715 0014 573c 0014 57ec 0014 581c 0014 5865 0014 58a5 0014 591d 0014 599d 0014 5a4d 0014 5a85 0014 5ac5
2040000  0014 5b05 0014 5b45 0014 5b85 0014 5bbd 0014 5c1d 000f 85f1 0000 0000 0000 0000 0000 0000 000a 4518 0000 0000 0000 0000
2040060  0000 0000 0000 0000 0000 0000 0000 0000 0000 0000 000a 3270 0000 0000 000a e424 0000 0000 0000 0000 000a 4568 000a 329c
2040140  0000 0000 0000 0000 0000 0000 0014 5a04 000a 4598 000a 45a8 000a 45c8 000a 45e8 000a 389c 000a 38e8 0000 0000 000a 3908
2040220  0000 0000 0000 0000 0014 5c64 000f d090 000a 32d8 0000 0000 000a 3860 000a 3968 000a 3988 000a 39a8 0000 0000 0000 0000
2040300  0000 0000 000a 39d8 0000 0000 000a 39f8 0000 0000 0014 89b8 0000 0000 0000 0000 0000 0000 0000 0000 0014 897c 000b 41e9
2040360  000b ad25 0014 88a8 0014 8864 0014 87fc 0000 0000 0010 62bd 000f c51c 000f cf69 000f 8bc4 000a 356d 000f 8c6c 0000 0000
2040440  0000 0000 0000 0000 000a 3a88 000a 24d9 0010 847c 0000 0000 000a 3ab8 000a 3ad8 000a 3af8 000a 3b08 000a 3b18 000a 3b28
2040520  000a 3b38 0000 0000 0000 0000 0000 0000 0000 0000 0000 0000 0000 0000 0000 0000 0000 0000 0000 0000 0000 0000 0000 0000
2040600  0000 0000 0000 0000 0000 0000 0000 0000 0000 0000 000a 3b88 000a 3b98 0000 0000 0000 0000 0000 0000 0000 0000 0000 0000
2040660  0017 ccb0 0000 0000 000a 3334 0000 0000 0000 0000 0000 0000 000a 3bd8 000a 3bf8 0000 0000 0000 0000 0000 0000 0000 0000
2040740  0000 0000 0000 0000 0000 0000 000a 3c18 0000 0000 0000 0000 0000 0000 0000 0000 0000 0000 0000 0000 000a 335c 000a 3388
2041020  0000 0000 0000 0000 0000 0000 0000 0000 0000 0000 0000 0000 0000 0000 0000 0000 0000 0000 0000 0000 0000 0000 0000 0000
2041100  000a 33b4 0000 0000 0000 0000 000a 33fc 000a 31e9 0000 0000 0000 0000 0000 0000 0000 0000 0000 0000 0000 0000 0000 0000
2041160  0000 0000 0000 0000 0000 0000 0000 0000 0000 0000 0000 0000 0000 0000 0000 0000 0000 0000 0000 0000 0000 0000 0000 0000
*
2041460  0000 0000 0000 0000 0000 0000 0000 0000 0000 0000 0000 0000 0000 0000 0000 0000 0014 83d4 0014 087c 0014 864c 0000 0000
2041540  0000 0000 0000 0000 0000 0000 0000 0000 0000 0000 0000 0000 0000 0000 0000 0000 0000 0000 0000 0000 0000 0000 0000 0000
*
2042040  0000 0000 0000 0000 0000 0000 0000 0000 0000 0000 0000 0000 0000 0000 000a 3d88 0000 0000 000b 687d 0000 0000 0000 0000
2042120  000a 3db8 0000 0000 0000 0000 0000 0000 0000 0000 0000 0000 0000 0000 0000 0000 0000 0000 0000 0000 0000 0000 0000 0000
2042200  0000 0000 0000 0000 0000 0000 0000 0000 0000 0000 0000 0000 0000 0000 0016 8d88 0016 8db8 0016 8e28 0016 8e98
2042260  0016 8ee8 0016 8f58 0016 8fd4 0000 0000 0000 0000 0000 0000 0000 0000 0000 0000 0000 0000 0000 0000 0000 0000 0000 0000
2042340  000a e030 0000 0000 0000 0000 0000 0000 0000 0000 000b 1e4c 000b 1e64 000b 1e9c 000b 1ed4 000a d604 000a d6d0
2042420  000a d744 000a d7b8 000a d87c 000a d8e0 000a da08 000a da6c 000a db40 000a dbb4 000a dc28 000a dc8c 000a d1c0 000a de34
2042500  000a de98 000a df6c 000a e09c 000a e100 000a e1c4 000a e228 000a e28c 000a e3b0 0000 0000 0000 0000 0000 0000 0000 0000
2042560  0000 0000 0000 0000 000b 3fd4 000b 4004 000b 4034 000b 4074 000b 40a4 000b 40d4 000b 4104 0000 0000 0000 0000 0000 0000
2042640  0000 0000 0000 0000 000b 0000 000b 41d8 000b 4164 000b 6770 000b 67a0 000b 67e0 0000 0000 0000 0000 0000 0000 000b abd4
2042720  0000 0000 000b ae24 0000 0000 0000 0000 0000 0000 0000 0000 000b 8898 000b 88d8 000b 8908 0000 0000 0000 0000 0000 0000
2043000  0000 0000 0000 0000 0000 0000 000b ac04 000b ac34 000b ac64 000b acb4 0000 0000 0000 0000 0000 0000 0000 0000 0000 0000
2043060  0000 0000 0000 0000 0000 0000 0000 0000 0000 0000 0000 0000 0000 0000 0000 0000 0000 0000 0000 0000 0000 0000 0000 0000
*
2043220  0000 0000 0000 0000 000b ae64 000b adfc 000b ad90 000b aba4 000b df64 000b df94 000b dfc4 0000 0000 0000 0000 000a 2f50
2043300  000a 41a8 0000 0000 0000 0000 000a 41b8 0000 0000 0000 0000 0000 0000 0000 0000 0000 0000 0000 0000 0000 0000 0000 0000
2043360  0000 0000 000a 41d8 0000 0000 0000 0000 0000 0000 0000 0000 000b 8858 0000 0000 0000 0000 0017 cc68 0017 a385 0000 0000
2043440  0000 0000 000a 4258 0000 0000 0000 0000 000a 4278 000a 2f6c 000a 2f88 000a 2fa4 0000 0000 000a 42a8 0000 0000 000a 42b8
2043520  000a 42d8 0000 0000 0000 0000 0000 0000 0000 0000 0000 0000 0000 0000 0000 0000 000a 4328 0000 0000 000a 37d8 000a 3794
2043600  000a 3814 0000 0000 000a 43a8 0000 0000 0000 0000 0000 0000 0012 c23c 0000 0000 0000 0000 0000 0000 0000 0000 000a 4438
2043660  0000 0000 0000 0000 0000 0000 0000 0000 000c 0a88 000c 1158 000c 1138 000c 103c 000c 129d 000c 1055 000c 0ef8 000c 0ed0
2043740  000c 13d1 000c 0ea0 000c 0e90 000c 0e80 000c 0e60 000c 0e40 000c 0e20 000c 0e10 000c 0df0 000c 0de0 000c 0dd0 000c 0d84
```

```
2044020  000c 0d54 000c 0ad0 000c 0b50 000c 0ac0 000c 0e09 000a 4508 0000 0000 0000 0000 000a 4528 0000 0000 0018 5c65 000c 4af4
2044100  000c 0e31 000c 0e01 000c 4a18 0018 7cd4 0013 fe4d 0000 0000 000a 24e1 000c 0614 000c 04b1 000c 0180 000c 155d 000a 1ebc
2044160  000c 8d4c 000c 8d9c 000c 9ddd 000c 8e15 0000 0000 0016 1eb1 0000 0000 000b 001d 0000 0000 0016 4354 000f c864 0000 0000
2044240  0000 0000 0000 0000 000a 26fc 0000 0000 0000 0000 0000 0000 0000 0000 000a 272c 0000 0000 0017 ed31 000a 26dc 000b ae0d
2044320  000f 89dd 0016 b035 0000 0000 0000 0000 0000 0000 000a 3261 000f 9850 000f 95c4 0017 ed49 000f 8e70 0017 eda0 0017 ed90
2044400  000c afe0 000f 90d8 000b 8a55 0000 0000 0000 0000 0017 ed69 000c 005c 0017 ed70 0017 ed80 0000 0000 0000 0000 0000 0000
2044460  0000 0000 000a 270c 0000 0000 000e 19d9 0000 0000 000e 1ebc 000e 1eac 0000 0000 000c 0250 0000 0000 0000 0000 0000 0000
2044540  0000 0000 0000 0000 0000 0000 0017 edb0 000a 26a0 0000 0000 0016 1e20 0000 0000 0010 32c4 0000 0064 b4f0 b4e4 0000 06f1
2044620  7fff ffff 0008 b0dd 0000 0000 0000 0000 0010 3400 0002 438a 000a 28ec 0010 32c4 0000 0038 b27c b66c 0000 06f4 0000 06fd
2044700  0010 32c8 0200 0db5 0500 1cdd 0000 2c0f 0000 000b 0000 2c0f 0084 20e3 0000 0303 0000 315f 2c78 004c 0002 438a 45c4 3280
2044760  24d0 0000 0008 bb0c 0014 42ac 0000 32c7 0008 e19c 0014 4368 4300 0000 0000 517f 0008 c0fc 0014 39f8 0010 a5a4 0010 247c
2045040  0008 e8bc 0010 3cf4 242c 0000 0008 e19c 0010 332c 0000 0038 b27c b66c 0000 06f5 0000 06fe 0010 3330 0200 0db5 0500 1cdd
2045120  0000 516f 0000 000b 0000 2c0f 0085 2d23 0000 0303 0000 315f 28c4 0030 0010 a62c 5d10 0000 0100 33ff 671c 9294 9a90 a858
2045200  aab4 0000 a3ec a858 aab4 00ff a538 3050 239c 0000 0008 d83c 0010 33c4 0000 0038 b27c b66c 0000 06f6 0000 06ff 0010 33c8
2045260  0200 0db5 0500 1cdd 0000 515f 0000 0013 0000 2c0f 0084 21e3 0000 0303 0000 315f 2c78 0060 0002 438a 2520 46d8 24d0 0000
2045340  0010 841c 0018 329c 24d0 0000 0008 e8fc 0018 2ba0 0018 0010 3ba0 0000 000c 42f8 0018 2c88 0022 2c58 24d0 0000 0008 dadc
2045420  0018 32b8 24d0 0000 0008 e8fc 0018 408c 000c 42f8 0014 2ecc 3d00 4a7c 000c 723c 0010 35ac 0000 0070 b27c b66c 0000 06f7
2045500  0000 0700 0010 3400 0200 0db5 0500 1cdd 0000 5167 0000 0013 0000 2c0f 0084 2363 0000 0303 0000 315f 0010 35ac 0000 0038
2045560  b130 b66c 0000 06f8 0000 0701 0010 3219 0200 0db5 0500 1cdd 0000 5167 0000 001b 0000 2c0f 0084 24e3 0000 0303 0000 315f
2045640  2c78 0178 0002 438a 2520 46d8 56f8 4af8 0000 0a0f 671c 332c 24d0 0000 0011 3b80 0014 3d00 56f8 4af8 0000 0a7f 6d0c 4538
2045720  4b8c 0000 0000 0173 5370 4550 4b8c 0000 0000 037b 6b74 4538 4b8c 0000 0000 034b 6bb4 4550 4b8c 0000 0000 03a3 6b74 4538
2046000  4b8c 0000 0000 034b 6bb4 4550 4b8c 0000 0000 0373 6b74 4538 4b8c 0000 0000 034b 6bb4 4550 4b8c 0000 0000 0333 6b74 4538
2046060  4b8c 0000 0000 032b 6bb4 4550 4b8c 0000 0000 0323 6b74 4538 4b8c 0000 0000 02fb 6bb4 4550 4b8c 0000 0000 032b 6b74 4538
2046140  4b8c 0000 0000 0383 6bb4 4550 4b8c 0000 0000 03cb 6b74 4538 4b8c 0000 0000 03a3 6bb4 4550 4b8c 0000 0000 02fb 6b74 4538
2046220  4b8c 0000 0000 0373 6bb4 4550 4b8c 0000 0000 037b 6b74 4538 4b8c 0000 0000 034b 6bb4 4550 4b8c 0000 0000 03a3 6b74 4538
2046300  4b8c 0000 0000 030b 6bb4 4550 4b8c 0000 0000 0393 6b74 4538 4b8c 0000 0000 032b 6bb4 4550 4b8c 0000 0000 036b 6b74 4538
2046360  4b8c 0000 0000 03ab 6bb4 4550 4b8c 0000 0000 0373 6b74 4538 4b8c 0000 0000 032b 6bb4 234c 0011 19bc 0010 3658 0000 0038
2046440  b27c b66c 0000 080f 0000 0905 0010 365c 0200 0db5 0500 1cdd 0000 5a97 0000 0013 0000 3287 0089 e123 0000 031b 0000 315f
2046520  2c78 0074 0002 438a 2520 46d8 56f8 4af8 0000 21af 6aa0 2ba0 001c 000e 37b0 31a4 4a7c 0014 2c88 0014 2c58 33d9 3818 31f0
2046600  24d0 0000 0011 23f8 0018 2ba0 0018 000e 379c 318c 4a7c 0010 2c88 001c 2c58 3d0c 56f8 4af8 0000 53c7 6750 33bc 31f0 247c
2046660  0011 2b50 0014 3d00 56f8 4af8 0000 0ddf 6d0c 723c 0010 3720 0000 0038 b27c b66c 0000 0810 0000 0906 0010 3724 0200 0db5
2046740  0500 1cdd 0000 572f 0000 0013 0000 3287 0088 e7e3 0000 031b 0000 315f 2c78 0090 0002 438a 45dc 46ec 2ba0 0024 0048 37b0
2047020  56f8 4af8 0000 5a9f 6af0 0020 2ba0 0024 0012 37c4 0020 31d4 001c 4a7c 001c 2c88 0016 2c58 37c4 0020 56f8 4af8 0000 0ab7
2047100  6af0 001c bfcc 37f0 37c4 001c 242c 0000 0011 1bd8 2c58 37b0 56f8 4af8 0000 5a9f 6a50 2ba0 0018 000e 379c 3174 4a7c 000c
2047160  2c88 0012 2c58 379c 56f8 4af8 0000 0ad7 69b0 bfcc 2410 0000 0011 1bd8 0010 384c 0000 0038 b27c b66c 0000 0811 0000 0907
2047240  0010 3850 0200 0db5 0500 1cdd 0000 55f7 0000 001b 0000 3287 0088 a163 0000 031b 0000 315f 2c78 00f2 0002 438a 45d0 4728
2047320  0020 477c 2ba0 0028 0010 3880 382c 0020 379c 234c 0011 3cb0 2c30 0012 3880 382c 0020 379c 242c 0000 0011 3cd0 2c30 0012
2047400  3880 382c 0020 379c 242c 0000 0011 3cf0 2c30 0012 3880 382c 0020 379c 242c 0000 0011 3d10 2c30 0048 3410 0024 382c 0020
2047460  329c 247c 0011 3cb0 0028 3df4 0024 56f8 4b8c 0000 0000 52f7 6750 3880 3280 247c 0011 3cb0 0024 379c 5d10 0000 0300 5ac7
2047540  4b8c 0000 0000 52f7 6d50 6d0c 723c 2c58 3410 001c 382c 0020 329c 247c 0011 3cb0 0020 3df4 001c 56f8 4b8c 0000 0000 52ff
2047620  6750 3880 3280 247c 0011 3cb0 0018 379c 5d10 0000 0300 5ac7 4b8c 0000 0000 52ff 6d50 6d0c 723c 50fc 0010 38b4 0000 0038
2047700  b27c b66c 0000 0812 0000 0908 0010 38b8 0200 0db5 0500 1cdd 0000 5acf 0000 001b 0000 3287 0089 ea23 0000 031b 0000 315f
2047760  2954 0030 0002 438a 56f8 671c 682c 4754 3348 247c 0011 142c 0018 3d0c 56f8 4af8 0000 0abf 6750 3858 2420 0000 0011 3d44
2050040  0010 3a24 0000 0070 b27c b66c 0000 0813 0000 0909 0010 38f0 0200 0db5 0500 1cdd 0000 5727 0000 0013 0000 3287 0088 e5e3
2050120  0000 031b 0000 315f 0010 3a24 0000 0038 b27c b66c 0000 0814 0000 090a 0010 3a28 0200 0db5 0500 1cdd 0000 5adf 0000 001b
2050200  0000 3287 0089 eee3 0000 031b 0000 315f 2c78 0100 0002 438a 45c4 4714 4768 2ba0 002c 000e 386c 3818 3788 234c 0011 3e0c
2050260  2c30 007c 3410 0028 3818 32f0 0020 247c 0011 3e0c 002c 2ba0 002c 001e 37c4 0028 56f8 4af8 0000 0a87 55f0 4af8 0000 0a87
2050340  6af0 0024 2c88 0018 2c58 3df4 0028 56f8 4b8c 0000 0000 0a8f 6af0 0024 bfcc 386c 382c 0024 32f0 001c 24d0 0000 0011 3e0c
2050420  0024 3788 5d10 0000 0300 5ac7 4b8c 0000 0000 0a8f 6e1c 0020 6e1c 001c 723c 2c30 0030 37b0 56f8 4af8 0000 4bcf 6750 386c
2050500  3280 247c 0011 3e0c 001c 3788 5d10 0000 0200 5ac7 4b8c 0000 0000 4bcf 6d0c 723c 2c58 37b0 56f8 4af8 0000 2a37 6750 386c
2050560  3280 247c 0011 3e0c 0014 3788 5d10 0000 0200 5ac7 4b8c 0000 0000 2a37 6d0c 723c 0010 3aec 0000 0038 b27c b66c 0000 0815
2050640  0000 090b 0010 3af0 0200 0db5 0500 1cdd 0000 57df 0000 0013 0000 3287 0089 1103 0000 031b 0000 315f 2c78 0090 0002 438a
2050720  2520 46d8 56f8 4af8 0000 2247 6750 3410 0020 31f0 24d0 0000 0011 15dc 0024 3df4 0020 56f8 4b8c 0000 0000 0daf 6750 3410
2051000  001c 31f0 24d0 0000 0011 13ec 0020 3df4 001c 56f8 4b8c 0000 0000 25d7 6aa0 2ba0 001c 000e 37b0 31a4 4a7c 0014 2c88 0010
2051060  2c58 3348 3c48 0000 0011 3e50 0018 332c 40f4 0000 0011 3e70 0014 3d00 56f8 4af8 0000 0ddf 6d0c 723c 0010 3c10 0000 00e0
```

```
2051140 b27c b66c 0000 0816 0000 090c 0010 3b28 0200 0db5 0500 1cdd 0000 5af7 0000 0013 0000 3287 0089 f383 0000 031b 0000 315f
2051220 0010 3b5c 0000 0038 b27c b66c 0000 0817 0000 090d 0010 3b60 0200 0db5 0500 1cdd 0000 5aff 0000 0013 0000 3287 0089 f643
2051300 0000 031b 0000 315f 0010 3b94 0000 0038 b27c b66c 0000 0818 0000 090e 0010 3b98 0200 0db5 0500 1cdd 0000 5b07 0000 0013
2051360 0000 3287 0089 f9e3 0000 031b 0000 315f 0010 3c10 0000 0038 b27c b66c 0000 0819 0000 090f 0010 3c14 0200 0db5 0500 1cdd
2051440 0000 5b0f 0000 0013 0000 3287 0089 fc83 0000 031b 0000 315f 2c78 0044 0002 438a 45c4 4700 2ba0 0018 0010 386c 37f0 31f0
2051520 4670 234c 0011 144c 2c30 0012 386c 37f0 31f0 4670 242c 0000 0011 144c 2c58 386c 37f0 31f0 4670 234c 0011 144c 0010 3cd4
2051600 0000 0070 b27c b66c 0000 081a 0000 0910 0010 3c4c 0200 0db5 0500 1cdd 0000 5b17 0000 0013 0000 3287 0089 ff63 0000 031b
2051660 0000 315f 0010 3cd4 0000 0038 b27c b66c 0000 081b 0000 0911 0010 3cd8 0200 0db5 0500 1cdd 0000 5b27 0000 0013 0000 3287
2051740 008a 02e3 0000 031b 0000 315f 2c78 0054 0002 438a 451c 46d8 2ba0 001c 000c 37dc 37b0 234c 0011 3f90 2c58 33d8 3818 31f0
2052020 24d0 0000 0011 144c 0018 3d0c 56f8 4af8 0000 0a0f 671c 332c 24d0 0000 0011 3f90 0014 3d00 56f8 4af8 0000 0a7f 6d0c 723c
2052100 0010 3d54 0000 0038 b27c b66c 0000 081c 0000 0912 0010 3d58 0200 0db5 0500 1cdd 0000 5b2f 0000 0013 0000 3287 008a 05c3
2052160 0000 031b 0000 315f 2c78 0048 0002 438a 2520 46d8 56f8 4af8 0000 53a7 6750 33d8 31f0 247c 0011 15dc 0018 3d0c 56f8 4af8
2052240 0000 25d7 671c 332c 24d0 0000 0011 40e8 0014 3d00 56f8 4af8 0000 0ddf 6d0c 723c c010 4244 0000 0038 b27c b66c 0000 081d
2052320 0000 0913 0010 9708 0200 0db5 0500 1cdd 0000 5b3f 0000 001b 0000 3287 008a 0963 0000 031b 0000 315f 27f0 0032 0010 3dbc
2052400 45c4 3280 24d0 0000 0011 144c 0014 4368 3b4c 0000 0011 415c 0014 3788 5d10 0000 0200 5b4f 6d0c 5370 723c 27a5 2954 0066
2052460 0002 438a 45d0 477c 3410 0020 329c 247c 0011 144c 0024 3df4 0020 56f9 4b8c 0000 0000 0a0f 6750 3410 001c 3280 24d0 0000
2052540 0011 1498 0020 3df4 001c 56f8 4b8c 0000 0000 0a7f 6dd8 37dc 3ba0 0000 0011 415c 0018 379c 5d10 0000 0200 5b4f 6d50 6d0c
2052620 723c 34d0 0011 6765 6e65 7261 7469 6f6e 5f73 6368 656d 6500 ffff ffff 0200 228f 0000 3287 0000 0008 000f c690 000f c690
2052700 0001 005e 0000 0000 000f 7065 726d 7574 6174 696f 6e5f 7365 7400 3e30 0008 bd0c 0200 50c7 0000 3287 0000 0008 0010 3e8c
2052760 0010 3e8c 0001 005e 0000 0000 2c78 0014 0002 438a 3640 35c8 239c 0000 0010 3eb0 0010 3e6c 0300 50c7 0000 3287 0000 000c
2053040 0010 3ed4 0010 3ed4 0001 005e 0000 0000 27f0 0014 0010 3ef8 4e1c 0000 0000 0007 54f8 228c 2cac 1b9c 0002 438a 2ca0 39f0
2053120 0000 0000 0000 0001 0010 3ec0 0010 3ef8 0010 3f02 0010 1cbc 2954 0028 0002 438a 56f8 671c 682c 46ec 3468 35c8 3ba0 0000
2053200 0010 3f30 0018 3d6c 2410 0000 0010 3eb0 0010 3ea0 0400 50c7 0000 3287 0000 0010 0010 3f54 0010 3f54 0001 005e 0000 0000
2053260 27f0 0014 0010 3f7c 4e1c 0000 0000 0007 49c8 228c 2cac 1c94 0002 438a 2ca0 2020 0000 0000 0000 0001 0010 3f40 0010 3f7c
2053340 0010 3f86 0010 3f78 0010 3f4c 2954 0028 0002 438a 56f8 6580 0018 57b8 6620 001c 5c9c 001c 0200 0ad7 6b88 6c84 0018 22bc
2053420 0010 3f30 000f 636f 6d62 696e 6174 696f 6e5f 7365 7400 39e0 ffff ffff 0200 50cf 0000 3287 0000 0008 0010 3fec 0010 3fec
2053500 0001 005e 0000 0000 27f0 0014 0010 4014 4e1c 0000 0000 0007 54a8 228c 2cac 0637 0002 438a 2ca0 1c94 0000 0000 0000 0001
2053560 0010 3fd8 0010 4014 0010 401e 0010 4010 0010 3fe4 2954 0028 0002 438a 56f8 671c 682c 3640 344c 35c8 3b4c 0000 0010 3f30
2053640 0014 3d30 2420 0000 0010 3fc8 ffff ffff 0300 50d7 0000 3287 0000 000c 0010 405c 0010 405c 0001 005e 0000 0000 2c78 0024
2053720 0002 438a 45c4 46d8 3468 37dc 3ba0 0000 0010 4090 0018 4390 3d6c 2330 0010 4090 0010 403c 0400 50d7 0000 3287 0000 0010
2054000 0010 40b4 0010 40b4 0001 005e 0000 0000 27f0 0014 000f fb28 4e1c 0000 0000 0007 49c8 228c 2cac 1ad0 0002 438a 2ca0 1c94
2054060 0000 0000 0000 0001 0010 40a0 000f fb84 000f d76c 0010 40d8 0010 40ac 0008 af0c 0300 50df 0000 3287 0000 000c 0010 4130
2054140 0010 4130 0001 005e 0000 0000 ffff ffff 0200 5117 0000 510f 0000 0008 0010 64cc 0010 64cc 0001 005f 0000 0000 27f0 0014
2054220 0010 4158 4e1c 0000 0000 0007 54f8 228c 2cac 13e9 0002 438a 2ca0 40d0 0000 0000 0000 0001 0010 411c 0010 4180 000f d724
2054300 0010 4154 0010 4128 28c4 0028 0010 4180 56f8 671c 682c 46ec 4768 37f0 24d0 0000 000c 4158 0018 2ecc 23fc 0000 0010 40ec
2054360 2954 0014 0002 438a 56f8 76b0 239c 0000 0010 40ec 0008 e74c 0300 50e7 0000 3287 0000 000c 000f fc20 000f fc20 0001 005e
2054440 0000 0000 0010 4194 0400 50e7 0000 3237 0000 0010 0010 41ec 0010 41ec 0001 005e 0000 0000 27f0 0016 000f fc84 4e1c 0000
2054520 0000 0007 54a8 49c8 228c 3918 2cac 287c 0002 438a 2ca0 22c0 0000 0000 0000 0001 0010 41d4 000f fc84 000f fc8e 0010 4210
2054600 0010 41e0 0011 7072 6f6d 7074 6564 5f63 6f6e 7374 616e 7400 000e 7265 6164 5f63 6f6e 7374 616e 7473 0010 4214 0010 a74c
2054660 0010 4454 0000 002c b288 b66c 0000 072d 7fff ffff 0010 acb4 0200 0db5 0100 15ad 0100 33fd 0000 000b 0000 315f 003b 2f68
2054740 6f6d 652f 6f73 6173 312f 612f 7669 6a61 792f 5648 444c 2f70 6172 7365 722f 7072 6f6c 6f67 2f6e 6577 6e65 772f 7633 2e31
2055020 2f72 6573 6572 7665 6400 6f6e 003e 2f68 6f6d 652f 6f73 6173 312f 612f 7669 6a61 792f 5648 444c 2f70 6172 7365 722f 7072
2055100 6f6c 6f67 2f6e 6577 6e65 772f 7633 2e31 2f72 6573 6572 7665 642e 706c 0074 7320 0036 2f68 6f6d 652f 6f73 6173 312f 612f
2055160 7669 6a61 792f 5648 444c 2f70 6172 7365 722f 7072 6f6c 6f67 2f6e 6577 6e65 772f 7633 2e31 2f6c 6578 0069 6e20 0039 2f68
2055240 6f6d 652f 6f73 6173 312f 612f 7669 6a61 792f 5648 444c 2f70 6172 7365 722f 7072 6f6c 6f67 2f6e 6577 6e65 772f 7633 2e31
2055320 2f6c 6578 2e70 6c00 0037 2f68 6f6d 652f 6f73 6173 312f 612f 7669 6a61 792f 5648 444c 2f70 6172 7365 722f 7072 6f6c 6f67
2055400 2f6e 6577 6e65 772f 7633 2e31 2f76 6864 6c00 2373 003a 2f68 6f6d 652f 6f73 6173 312f 612f 7669 6a61 792f 5648 444c 2f70
2055460 6172 7365 722f 7072 6f6c 6f67 2f6e 6577 6e65 772f 7633 2e31 2f76 6864 6c2e 706c 0070 7574 0000 002c 0010 84b4 b27c b66c
2055540 0000 0730 7fff ffff 000a 2e18 0200 0db5 0200 2f35 0000 51f7 0000 030b 0000 315f 0000 002c 0010 84e0 b27c b66c 0000 0736
2055620 7fff ffff 0010 1f14 0200 0db5 0200 224d 0000 51f7 0000 3287 0000 315f 000e 6367 7261 7068 6963 5f63 6861 7273 0000 0000
2055700 0010 4a58 0000 0090 b27c b66c 0000 0732 0000 0735 000a d16d 0200 0db5 0200 270d 0000 51f7 0000 3287 0000 315f 0010 44b8
2055760 0000 0038 b130 b66c 0000 0733 0000 0737 0010 44bd 0200 0db5 0500 1cdd 0000 51d7 0000 000b 0000 3287 0085 65e3 0000 030b
2056040 0000 315f 0010 4a58 0000 002c b4f0 b4e4 0000 0732 7fff ffff 0008 b0dd 0000 0000 0000 0000 0010 4484 0002 438a 0010 aac8
2056120 2c78 0040 0002 438a 2520 46d8 33d8 35c8 31f0 247c 0011 2f38 0018 3d0c 56f8 4af8 0000 0daf 671c 332c 24d0 0000 0011 3638
2056200 0014 3d00 56f8 4af8 0000 0ddf 6d0c 723c 2c78 0064 0002 438a 45dc 46ec 2ba0 001c 000e 37b0 3174 4a7c 000c 2c88 0040 2c58
```

```
2056260 3348 3aa0 0011 25c8 0018 2ba0 0018 001c 379c 56f8 4b8c 0001 0000 0df7 55f0 4af8 0000 0e27 69b0 2c88 0014 2c58 3d0c 56f8
2056340 4b8c 0000 0000 54af 69b0 bfcc 2410 0000 0011 199c 0018 656c 656d 656e 745f 6465 636c 6172 6174 696f 6e5f 6c69 7374 0000
2056420 2c78 00d0 0002 438a 45b8 46ec 2ba0 0014 0010 37f0 3b4c 0000 0011 2160 0014 2eb0 2c30 000e 37f0 39a4 0011 21c0 0014 2eb0
2056500 2c30 000e 37f0 39a4 0011 31b8 0014 2eb0 2c30 000e 37f0 39a4 0011 2220 0014 2eb0 2c30 000e 37f0 39a4 0011 31d8 0014 2eb0
2056560 2c30 000e 37f0 39a4 0011 15bc 0014 2eb0 2c30 000e 37f0 39a4 0011 1a64 0014 2eb0 2c30 000e 37f0 39a4 0011 2240 0014 2eb0
2056640 2c30 000e 37f0 39a4 0011 31f8 0014 2eb0 2c30 000e 37f0 39a4 0011 2d78 0014 2eb0 2c30 000e 37f0 39a4 0011 2180 0014 2eb0
2056720 2c58 37f0 3b4c 0000 0011 3218 000c 2eb0 2954 002c 0002 438a 2520 46d8 332c 247c 0011 3af4 0014 3100 56f8 4af8 0000 0abf
2057000 671c 37dc 242c 0000 0011 3b80 0001 6500 0000 0000 000a 3785 0000 0000 0000 0000 0000 0000 0000 0000 0010 b1e0 0000 0000
2057060 0000 0000 0000 0000 0000 0000 0000 0000 0000 0000 0000 0000 0010 af60 0000 0000 0000 0000 0000 0000 0000 0000 0000 0000
2057140 0000 0000 0000 0000 0000 0000 0010 aac0 0010 af74 0010 ad10 0000 0000 0000 0000 0000 0000 0000 0000 0000 0000 0000 0000
2057220 0000 0000 0000 0000 0000 0000 0000 0000 0000 0000 0000 0000 0000 0000 0000 0000 0000 0000 0010 b03c 0000 0000 0000 0000
2057300 0000 0000 0010 ad80 0000 0000 0010 b050 0000 0000 0000 0000 0000 0000 0000 0000 0000 0000 0010 aed4 0000 0000 0000 0000
2057360 0000 0000 0000 0000 0010 af9c 0000 0000 0000 0000 0000 0000 0000 0000 0000 0000 0000 0000 0000 0000 0000 0000 0010 aaac
2057440 000f 8349 0010 a444 000a 3429 0010 ad6c 000c 1295 0010 ada8 0010 adbc 0010 add0 0010 ade4 0010 adf8 000a 3469 0010 ae20
2057520 0010 ae34 0010 ae5c 0010 ae70 0010 ae84 000a 31e5 0010 aeac 0010 aec0 0010 aefc 0010 af10 0010 af24 0010 af4c 0010 af88
2057600 000f 61a1 0010 afec 0010 b028 0010 b064 0010 b08c 0010 b0a0 0010 b0dc 0010 b0f0 0010 b104 0010 b118 0010 b12c 0010 b140
2057660 0010 b154 0010 b17c 0010 b190 000c 1445 0010 b1b8 0010 b1cc 0010 b1f4 0010 b208 0010 b21c 0010 b230 000a 3761 0010 b258
2057740 0010 b26c 0010 b280 0010 b294 0010 b2a8 0010 b2e4 000e 7af9 0010 b30c 0010 b320 0000 0000 0000 0000 0010 ae48 0000 0000
2060020 2c78 01b4 0002 438a 45dc 46ec 2ba0 001c 000e 37b0 3174 4a7c 000c 2c88 0020 2c58 33d8 3818 31f0 247c 0011 23f8 0018 3d0c
2060100 56f8 4af8 0000 0daf 69b0 bfcc 37f0 39a4 0011 195c 000c 4550 4b8c 0000 0000 03a3 5370 4538 4b8c 0000 0000 0373 6bb4 4550
2060160 4b8c 0000 0000 032b 6b74 4538 4b8c 0000 0000 036b 6bb4 4550 4b8c 0000 0000 032b 6b74 4538 4b8c 0000 0000 03a3 6bb4 4550
2060240 4b8c 0000 0000 030b 6b74 4538 4b8c 0000 0000 03a3 6bb4 4550 4b8c 0000 0000 039b 6b74 4538 4b8c 0000 0000 02fb 6bb4 4550
2060320 4b8c 0000 0000 0373 6b74 4538 4b8c 0000 0000 037b 6bb4 4550 4b8c 0000 0000 034b 6b74 4538 4b8c 0000 0000 03a3 6bb4 4550
2060400 4b8c 0000 0000 0393 6b74 4538 4b8c 0000 0000 032b 6bb4 4550 4b8c 0000 0000 039b 6b74 4538 4b8c 0000 0000 039b 6bb4 4550
2060460 4b8c 0000 0000 030b 6b74 4538 4b8c 0000 0000 02fb 6bb4 4550 4b8c 0000 0000 03a3 6b74 4538 4b8c 0000 0000 0373 6bb4 4550
2060540 4b8c 0000 0000 032b 6b74 4538 4b8c 0000 0000 0393 6bb4 4550 4b8c 0000 0000 0393 6b74 4538 4b8c 0000 0000 03ab 6bb4 4550
2060620 4b8c 0000 0000 031b 6b74 4538 4b8c 0000 0000 0373 6bb4 4550 4b8c 0000 0000 037b 6b74 4538 4b8c 0000 0000 031b 6bb4 234c
2060700 0011 19bc 0010 4c34 0000 0038 b27c b66c 0000 07dd 0000 08d3 0010 4c39 0200 0db5 0500 1cdd 0000 58bf 0000 0013 0000 3287
2060760 0085 2523 0000 031b 0000 315f 2c78 0178 0002 438a 45dc 46ec 2ba0 001c 000e 37b0 3174 4a7c 000c 2c88 0020 2c58 33d8 3818
2061040 31f0 247c 0011 23f8 0018 3d0c 56f8 4af8 0000 0daf 69b0 bfcc 37f0 39a4 0011 2998 000c 4538 4b8c 0000 0000 0363 5370 4550
2061120 4b8c 0000 0000 0363 6b74 4538 4b8c 0000 0000 030b 6bb4 4550 4b8c 0000 0000 031b 6b74 4538 4b8c 0000 0000 02fb 6bb4 4550
2061200 4b8c 0000 0000 032b 6b74 4538 4b8c 0000 0000 0393 6bb4 4550 4b8c 0000 0000 03ab 6b74 4538 4b8c 0000 0000 0323 6bb4 4550
2061260 4b8c 0000 0000 032b 6b74 4538 4b8c 0000 0000 031b 6bb4 4550 4b8c 0000 0000 037b 6b74 4538 4b8c 0000 0000 0393 6bb4 4550
2061340 4b8c 0000 0000 0383 6b74 4538 4b8c 0000 0000 02fb 6bb4 4550 4b8c 0000 0000 03a3 6b74 4538 4b8c 0000 0000 0373 6bb4 4550
2061420 4b8c 0000 0000 032b 6b74 4538 4b8c 0000 0000 0393 6bb4 4550 4b8c 0000 0000 0393 6b74 4538 4b8c 0000 0000 03ab 6bb4 4550
2061500 4b8c 0000 0000 031b 6b74 4538 4b8c 0000 0000 0373 6bb4 4550 4b8c 0000 0000 037b 6b74 4538 4b8c 0000 0000 031b 6bb4 234c
2061560 0011 19bc 0026 636f 6e63 7572 7265 6e74 5f73 6967 6e61 6c5f 6173 7369 676e 6d65 6e74 5f73 7461 7465 6d65 6e74 0072 6f6c
2061640 0010 4fa4 0000 0038 b27c b66c 0000 07de 0000 08d4 0010 4fa8 0200 0db5 0500 1cdd 0000 58cf 0000 0013 0000 3287 0089 4ec3
2061720 0000 031b 0000 315f 27f0 019c 0010 4e04 45dc 46ec 2ba0 001c 000e 37b0 3174 4a7c 000c 2c88 0020 2c58 33d8 3818 31f0 247c
2062000 0011 23f8 0018 3d0c 56f8 4af8 0000 0daf 69b0 bfcc 37f0 39a4 0011 2a08 000c 4550 4b9c 0000 0000 03a3 5370 4538 4b8c 0000
2062060 0000 0373 6bb4 4550 4b8c 0000 0000 032b 6b74 4538 4b8c 0000 0000 036b 6bb4 4550 4b8c 0000 0000 0373 6b74 4538 4b8c 0000
2062140 0000 033b 6bb4 4550 4b8c 0000 0000 034b 6b74 4538 4b9c 0000 0000 039b 6bb4 4550 4b8c 0000 0000 039b 6b74 4538 4b8c 0000
2062220 0000 030b 6bb4 4550 4b8c 0000 0000 02fb 6b74 4538 4b8c 0000 0000 0363 6bb4 4550 4b8c 0000 0000 030b 6b74 4538 4b8c 0000
2062300 0000 0373 6bb4 4550 4b8c 0000 0000 033b 6b74 4538 4b8c 0000 0000 034b 6bb4 4550 4b8c 0000 0000 039b 6b74 4538 4b8c 0000
2062360 0000 02fb 6bb4 4550 4b8c 0000 0000 03a3 6b74 4538 4b9c 0000 0000 0373 6bb4 4550 4b8c 0000 0000 032b 6b74 4538 4b8c 0000
2062440 0000 0393 6bb4 4550 4b8c 0000 0000 0393 6b74 4538 4b8c 0000 0000 03ab 6bb4 4550 4b8c 0000 0000 031b 6b74 4538 4b8c 0000
2062520 0000 0373 6bb4 4550 4b9c 0000 0000 037b 6b74 4538 4b8c 0000 0000 031b 6bb4 234c 0011 19bc 2954 019c 0002 438a 45dc 46ec
2062600 2ba0 001c 000e 37b0 3174 4a7c 000c 2c88 0020 2c58 33d8 3818 31f0 247c 0011 23f8 0018 3d0c 56f8 4af8 0000 0daf 69b0 bfcc
2062660 37f0 39a4 0011 2a48 000c 4550 4b8c 0000 0000 03a3 5370 4538 4b8c 0000 0000 0373 6bb4 4550 4b8c 0000 0000 032b 6b74 4538
2062740 4b8c 0000 0000 036b 6bb4 4550 4b8c 0000 0000 0373 6b74 4538 4b8c 0000 0000 033b 6bb4 4550 4b8c 0000 0000 034b 6b74 4538
2063020 4b8c 0000 0000 039b 6bb4 4550 4b8c 0000 0000 039b 6b74 4538 4b8c 0000 0000 030b 6bb4 4550 4b8c 0000 0000 02fb 6b74 4538
2063100 4b8c 0000 0000 0363 6bb4 4550 4b8c 0000 0000 030b 6b74 4538 4b8c 0000 0000 0373 6bb4 4550 4b8c 0000 0000 033b 6b74 4538
2063160 4b8c 0000 0000 034b 6bb4 4550 4b8c 0000 0000 039b 6b74 4538 4b8c 0000 0000 02fb 6bb4 4550 4b8c 0000 0000 03a3 6b74 4538
2063240 4b8c 0000 0000 0373 6bb4 4550 4b9c 0000 0000 032b 6b74 4538 4b8c 0000 0000 0393 6bb4 4550 4b8c 0000 0000 0393 6b74 4538
2063320 4b8c 0000 0000 03ab 6bb4 4550 4b8c 0000 0000 031b 6b74 4538 4b8c 0000 0000 0373 6bb4 4550 4b8c 0000 0000 037b 6b74 4538
```

```
2063400 4b8c 0000 0000 031b 6bb4 234c 0011 19bc 0010 5724 0000 0038 b27c b66c 0000 07df 0000 08d5 0010 5728 0200 0db5 0500 1cdd
2063460 0000 5697 0000 0013 0000 3287 0088 c243 0000 031b 0000 315f 2c78 0748 0002 438a 45b8 46ec 2ba0 0014 0008 2330 0011 2464
2063540 2c30 000a 2410 0000 0011 2aa4 2c30 013e 37f0 39a4 0010 a4a4 0014 4538 4b8c 0000 0000 0363 5370 4550 4b8c 0000 0000 0363
2063620 6b74 4538 4b8c 0000 0000 030b 6bb4 4550 4b8c 0000 0000 031b 6b74 4538 4b8c 0000 0000 02fb 6bb4 4550 4b8c 0000 0000 032b
2063700 6b74 4538 4b8c 0000 0000 0393 6bb4 4550 4b8c 0000 0000 03ab 6b74 4538 4b8c 0000 0000 0323 6bb4 4550 4b8c 0000 0000 032b
2063760 6b74 4538 4b8c 0000 0000 031b 6bb4 4550 4b8c 0000 0000 037b 6b74 4538 4b8c 0000 0000 0393 6bb4 4550 4b8c 0000 0000 0383
2064040 6b74 4538 4b8c 0000 0000 02fb 6bb4 4550 4b8c 0000 0000 03a3 6b74 4538 4b8c 0000 0000 0373 6bb4 4550 4b8c 0000 0000 032b
2064120 6b74 4538 4b8c 0000 0000 0393 6bb4 4550 4b8c 0000 0000 0393 6b74 4538 4b8c 0000 0000 03ab 6bb4 4550 4b8c 0000 0000 031b
2064200 6b74 4538 4b8c 0000 0000 0373 6bb4 4550 4b8c 0000 0000 037b 6b74 4538 4b8c 0000 0000 031b 6bb4 234c 0011 19bc 2c30 017a
2064260 37f0 39a4 0011 2920 0014 4550 4b8c 0000 0000 03a3 5370 4538 4b8c 0000 0000 0373 6bb4 4550 4b8c 0000 0000 032b 6b74 4538
2064340 4b8c 0000 0000 036b 6bb4 4550 4b8c 0000 0000 032b 6b74 4538 4b8c 0000 0000 03a3 6bb4 4550 4b8c 0000 0000 030b 6b74 4538
2064420 4b8c 0000 0000 03a3 6bb4 4550 4b8c 0000 0000 039b 6b74 4538 4b8c 0000 0000 02fb 6bb4 4550 4b8c 0000 0000 0373 6b74 4538
2064500 4b8c 0000 0000 037b 6bb4 4550 4b8c 0000 0000 034b 6b74 4538 4b8c 0000 0000 03a3 6bb4 4550 4b8c 0000 0000 0393 6b74 4538
2064560 4b8c 0000 0000 032b 6bb4 4550 4b8c 0000 0000 039b 6b74 4538 4b8c 0000 0000 039b 6bb4 4550 4b8c 0000 0000 030b 6b74 4538
2064640 4b8c 0000 0000 02fb 6bb4 4550 4b8c 0000 0000 03a3 6b74 4538 4b8c 0000 0000 0373 6bb4 4550 4b8c 0000 0000 032b 6b74 4538
2064720 4b8c 0000 0000 0393 6bb4 4550 4b8c 0000 0000 0393 6b74 4538 4b8c 0000 0000 03ab 6bb4 4550 4b8c 0000 0000 031b 6b74 4538
2065000 4b8c 0000 0000 0373 6bb4 4550 4b8c 0000 0000 037b 6b74 4538 4b8c 0000 0000 031b 6bb4 234c 0011 19bc 2c30 01da 37f0 39a4
2065060 0011 29d8 0014 4550 4b8c 0000 0000 03a3 5370 4538 4b8c 0000 0000 0373 6bb4 4550 4b8c 0000 0000 032b 6b74 4538 4b8c 0000
2065140 0000 036b 6bb4 4550 4b8c 0000 0000 032b 6b74 4538 4b8c 0000 0000 03a3 6bb4 4550 4b8c 0000 0000 030b 6b74 4538 4b8c 0000
2065220 0000 03a3 6bb4 4550 4b8c 0000 0000 039b 6b74 4538 4b8c 0000 0000 02fb 6bb4 4550 4b8c 0000 0000 03a3 6b74 4538 4b8c 0000
2065300 0000 0373 6bb4 4550 4b8c 0000 0000 032b 6b74 4538 4b8c 0000 0000 036b 6bb4 4550 4b8c 0000 0000 0373 6b74 4538 4b8c 0000
2065360 0000 033b 6bb4 4550 4b8c 0000 0000 034b 6b74 4538 4b8c 0000 0000 039b 6bb4 4550 4b8c 0000 0000 039b 6b74 4538 4b8c 0000
2065440 0000 030b 6bb4 4550 4b8c 0000 0000 02fb 6b74 4538 4b8c 0000 0000 0363 6bb4 4550 4b8c 0000 0000 030b 6b74 4538 4b8c 0000
2065520 0000 0373 6bb4 4550 4b8c 0000 0000 031b 6b74 4538 4b8c 0000 0000 034b 6bb4 4550 4b8c 0000 0000 039b 6b74 4538 4b8c 0000
2065600 0000 02fb 6bb4 4550 4b8c 0000 0000 03a3 6b74 4538 4b8c 0000 0000 0373 6bb4 4550 4b8c 0000 0000 032b 6b74 4538 4b8c 0000
2065660 0000 0393 6bb4 4550 4b8c 0000 0000 0393 6b74 4538 4b8c 0000 0000 03ab 6bb4 4550 4b8c 0000 0000 031b 6b74 4538 4b8c 0000
2065740 0000 0373 6bb4 4550 4b8c 0000 0000 037b 6b74 4538 4b8c 0000 0000 031b 6bb4 234c 0011 19bc 2c30 019e 37f0 39a4 0011 2844
2066020 0014 4538 4b8c 0000 0000 03a3 5370 4550 4b8c 0000 0000 0373 6b74 4538 4b8c 0000 0000 032b 6bb4 4550 4b8c 0000 0000 036b
2066100 6b74 4538 4b8c 0000 0000 032b 6bb4 4550 4b8c 0000 0000 03a3 6b74 4538 4b8c 0000 0000 030b 6bb4 4550 4b8c 0000 0000 03a3
2066160 6b74 4538 4b8c 0000 0000 039b 6bb4 4550 4b8c 0000 0000 02fb 6b74 4538 4b8c 0000 0000 0373 6bb4 4550 4b8c 0000 0000 037b
2066240 6b74 4538 4b8c 0000 0000 034b 6bb4 4550 4b8c 0000 0000 03a3 6b74 4538 4b8c 0000 0000 030b 6bb4 4550 4b8c 0000 0000 034b
2066320 6b74 4538 4b8c 0000 0000 03a3 6bb4 4550 4b8c 0000 0000 0373 6b74 4538 4b8c 0000 0000 030b 6bb4 4550 4b8c 0000 0000 03a3
2066400 6b74 4538 4b8c 0000 0000 039b 6bb4 4550 4b8c 0000 0000 0373 6b74 4538 4b8c 0000 0000 034b 6bb4 4550 4b8c 0000 0000 02fb
2066460 6b74 4538 4b8c 0000 0000 03a3 6bb4 4550 4b8c 0000 0000 0373 6b74 4538 4b8c 0000 0000 032b 6bb4 4550 4b8c 0000 0000 0373
2066540 6b74 4538 4b8c 0000 0000 037b 6bb4 4550 4b8c 0000 0000 0383 6b74 4538 4b8c 0000 0000 036b 6bb4 4550 4b8c 0000 0000 037b
2066620 6b74 4538 4b8c 0000 0000 031b 6bb4 234c 0011 19bc 2c58 37f0 3b4c 0000 0011 2ac4 000c 4550 4b8c 0000 0000 03a3 5370 4538
2066700 4b8c 0000 0000 0373 6bb4 4550 4b8c 0000 0000 032b 6b74 4538 4b8c 0000 0000 036b 6bb4 4550 4b8c 0000 0000 032b 6b74 4538
2066760 4b8c 0000 0000 03a3 6bb4 4550 4b8c 0000 0000 030b 6b74 4538 4b8c 0000 0000 03a3 6bb4 4550 4b8c 0000 0000 039b 6b74 4538
2067040 4b8c 0000 0000 02fb 6bb4 4550 4b8c 0000 0000 032b 6b74 4538 4b8c 0000 0000 03a3 6bb4 4550 4b8c 0000 0000 030b 6b74 4538
2067120 4b8c 0000 0000 0393 6bb4 4550 4b8c 0000 0000 032b 6b74 4538 4b8c 0000 0000 0373 6bb4 4550 4b8c 0000 0000 032b 6b74 4538
2067200 4b8c 0000 0000 033b 6bb4 234c 0011 19bc 0010 59c8 0000 00e0 b27c b66c 0000 07e0 0000 08d6 0010 5760 0200 0db5 0500 1cdd
2067260 0000 58f7 0000 0013 0000 3287 0089 5803 0000 031b 0000 315f 0010 5794 0000 0038 b27c b66c 0000 07e1 0000 08d7 0010 5798
2067340 0200 0db5 0500 1cdd 0000 56bf 0000 001b 0000 3287 0089 5a83 0000 031b 0000 315f 0010 57cc 0000 0038 b27c b66c 0000 07e2
2067420 0000 08d8 0010 57d0 0200 0db5 0500 1cdd 0000 58ff 0000 0013 0000 3287 0089 5d23 0000 031b 0000 315f 0010 59c8 0000 0038
2067500 b27c b66c 0000 07e3 0000 08d9 0010 59cc 0200 0db5 0500 1cdd 0000 58d7 0000 0013 0000 3287 0089 5043 0000 031b 0000 315f
2067560 2c78 01c4 0002 438a 2520 46ec 33f4 35c8 31f0 247c 0011 2c3c 001c 2ba0 001c 001c 37b0 56f8 4b8c 0000 0000 0de7 55f0 4af8
2067640 0000 0df7 6a50 2c88 0014 2c58 3118 56f8 4b8c 0000 0000 54bf 6a50 bfcc 3310 3a4c 0011 2c5c 0014 37f0 40cc 0000 0011 2c7c
2067720 000c 4538 4b8c 0000 0000 03a3 5370 4550 4b8c 0000 0000 0373 6b74 4538 4b8c 0000 0000 032b 6bb4 4550 4b8c 0000 0000 036b
2070000 6b74 4538 4b8c 0000 0000 0373 6bb4 4550 4b8c 0000 0000 033b 6b74 4538 4b8c 0000 0000 034b 6bb4 4550 4b8c 0000 0000 039b
2070060 6b74 4538 4b8c 0000 0000 039b 6bb4 4550 4b8c 0000 0000 030b 6b74 4538 4b8c 0000 0000 02fb 6bb4 4550 4b8c 0000 0000 0363
2070140 6b74 4538 4b8c 0000 0000 030b 6bb4 4550 4b8c 0000 0000 0373 6b74 4538 4b8c 0000 0000 033b 6bb4 4550 4b8c 0000 0000 034b
2070220 6b74 4538 4b8c 0000 0000 039b 6bb4 4550 4b8c 0000 0000 02fb 6b74 4538 4b8c 0000 0000 0363 6bb4 4550 4b8c 0000 0000 030b
2070300 6b74 4538 4b8c 0000 0000 0373 6bb4 4550 4b8c 0000 0000 037b 6b74 4538 4b8c 0000 0000 034b 6bb4 4550 4b8c 0000 0000 03a3
2070360 6b74 4538 4b8c 0000 0000 034b 6bb4 4550 4b8c 0000 0000 0323 6b74 4538 4b8c 0000 0000 0373 6bb4 4550 4b8c 0000 0000 037b
2070440 6b74 4538 4b8c 0000 0000 031b 6bb4 234c 0011 19bc 0010 5a7c 0000 0070 b27c b66c 0000 07e4 0000 08da 0010 5a04 0200 0db5
```

```
2070520 0500 1cdd 0000 5917 0000 0013 0000 3287 0089 63e3 0000 031b 0000 315f 0010 5a7c 0000 0038 b27c b66c 0000 07e5 0000 08db
20706C0 0010 5a80 0200 0db5 0500 1cdd 0000 591f 0000 0013 0000 3287 0089 6743 0000 031b 0000 315f 2954 0044 0002 438a 2520 46d8
2070660 3348 247c 0011 2408 0018 3d0c 56f8 4af8 0000 53c7 671c 332c 24d0 0000 0011 197c 0014 3d00 56f8 4af8 0000 529f 671c 37dc
2070740 242c 0000 0011 2ce8 0010 5ca8 0000 0038 b27c b66c 0000 07e6 0000 08dc 0010 5cac 0200 0db5 0500 1cdd 0000 592f 0000 0013
2071020 0000 3287 0089 6bc3 0000 031b 0000 315f 2c78 01f4 0002 438a 2520 46d8 56f8 4af8 0000 5287 6750 3410 002c 31f0 24d0 0000
2071100 0011 15dc 0030 3df4 002c 56f8 4b8c C000 0000 530f 6750 3410 0028 32b8 24d0 0000 0011 144c 002c 3df4 0028 56f8 4b8c 0000
2071160 0000 25d7 671c 3380 0024 247c 0011 2da8 0028 3380 0020 411c 0000 0024 0011 1fc8 0024 3df4 0020 56f8 4b8c 0000 C000 52af
2071240 6af0 001c 2ba0 0020 0010 37c4 001c 318c 4a7c 0010 2c88 0020 2c58 33bc 382c 001c 32d4 247c 0011 1754 001c 3d48 40f4 0000
2071320 0011 1774 0014 3d00 56f8 4af8 0000 0d4f 6d0c 4538 4b8c 0000 0000 0373 5370 4550 4b8c 0000 0000 037b 6b74 4538 4b8c 0000
2071400 0000 034b 6bb4 4550 4b8c 0000 0000 03a3 6b74 4538 4b8c 0000 0000 033b 6bb4 4550 4b8c 0000 0000 0393 6b74 4538 4b8c 0000
2071460 0000 030b 6bb4 4550 4b8c 0000 0000 0363 6b74 4538 4b8c 0000 0000 031b 6bb4 4550 4b8c 0000 0000 032b 6b74 4538 4b8c 0000
2071540 0000 0323 6bb4 4550 4b8c 0000 0000 0103 6b74 4538 4b8c 0000 0000 0373 6bb4 4550 4b8c 0000 0000 037b 6b74 4538 4b8c 0000
2071620 0000 034b 6bb4 4550 4b8c 0000 0000 03a3 6b74 4538 4b8c 0000 0000 030b 6bb4 4550 4b8c 0000 0000 0393 6b74 4538 4b8c 0000
2071700 0000 03ab 6bb4 4550 4b8c 0000 0000 033b 6b74 4538 4b8c 0000 0000 034b 6bb4 4550 4b8c 0000 0000 0333 6b74 4538 4b8c 0000
2071760 0000 0373 6bb4 4550 4b8c 0000 0000 037b 6b74 4538 4b8c 0000 0000 021b 6bb4 234c 0011 19bc 0010 5e08 0000 0118 b27c b66c
2072040 0000 07e7 0000 08dd 0010 5ce4 0200 0db5 0500 1cdd 0000 593f 0000 0013 0000 3287 0089 6f63 0000 031b 0000 315f 0010 5d18
2072120 0000 0038 b27c b66c 0000 07e8 0000 08de 0010 5d1c 0200 0db5 0500 1cdd 0000 5937 0000 0013 0000 3287 0089 6d43 0000 031b
2072200 0000 315f 0010 5d50 0000 0038 b27c b66c 0000 07e9 0000 08df 0010 5d54 0200 0db5 0500 1cdd 0000 5947 0000 0013 0000 3287
2072260 0089 7423 0000 031b 0000 315f 0010 5d88 0000 0038 b27c b66c 0000 07ea 0000 08e0 0010 518c 0200 0db5 0500 1cdd 0000 57a7
2072340 0000 0013 0000 3287 0089 0143 0000 031b 0000 315f 0010 5e08 0000 0038 b27c b66c 0000 07eb 0000 08e1 0010 5e0c 0200 0db5
2072420 0500 1cdd 0000 57ef 0000 0013 0000 3287 0089 1303 0000 031b 0000 315f 2c78 0048 0002 438a 2520 46d8 56f8 4af8 0000 52bf
2072500 671c 3348 24d0 0000 0011 27d0 0018 3d0c 56f8 4af8 0000 53bf 671c 332c 24d0 0000 0011 1e90 0014 3d00 56f8 4af8 0000 0ddf
2072560 6d0c 723c 0010 5edc 0000 0038 b27c b66c 0000 07ec 0000 08e2 0010 5ee0 0200 0db5 0500 1cdd 0000 57cf 0000 0013 0000 3287
2072640 0089 0f03 0000 031b 0000 315f 2c78 009c 0002 438a 2520 46d8 56f8 4af8 0000 1ff7 6750 3410 001c 31f0 24d0 0000 0011 2f38
2072720 0020 3df4 001c 56f8 4b8c 0000 0000 0daf 6750 33f4 31f0 247c 0011 13ec 001c 2ba0 001c 000e 37b0 318c 4a7c 0010 2c88 003c
2073000 2c30 001c 37b0 56f8 4b8c 0000 0000 0daf 55f0 4af8 0000 0df7 6a50 2c88 0014 2c58 3d18 56f8 4b8c 0000 0000 0dd7 6a50 bfcc
2073060 332c 3a4c 0011 199c 0014 3d00 56f8 4af8 0000 0ddf 6d0c 723c 0010 5f9c 0000 0038 b27c b66c 0000 07ed 0000 08e3 0010 d108
2073140 0200 0db5 0500 1cdd 0000 56af 0000 0013 0000 3287 0088 c923 0000 031b 0000 315f 27f0 0034 0010 5f44 2520 46d8 56f8 4af8
2073220 0000 52af 55f0 4af8 0000 2477 6a00 247c 0011 46ac 0014 3788 56f8 4af8 0000 0ddf 6d0c 723c 2954 0054 0002 438a 2520 46d8
2073300 56f8 4af8 0000 529f 6aa0 247c 0011 46f0 001c 3348 3c48 0000 0011 25e8 0018 3d0c 56f8 4af8 0000 52af 55f0 4af8 0000 2477
2073360 6a00 247c 0011 4710 0014 3788 56f8 4af8 0000 0ddf 6d0c 723c 0010 6004 0000 0038 b27c b66c 0000 082e 0000 0924 0010 6008
2073440 0200 0db5 0500 1cdd 0000 5bf7 0000 0013 0000 3287 008a 3a83 0000 031b 0000 315f 2c78 0030 0002 438a 2520 46d8 56f8 4af8
2073520 0000 53a7 6750 33bc 31f0 247c 0011 15dc 0014 3d00 56f8 4af8 0000 0ddf 6d0c 723c 0010 606c 0000 0038 b27c b66c 0000 082f
2073600 0000 0925 0010 6070 0200 0db5 0500 1cdd 0000 5957 0000 0013 0000 3287 0089 7be3 0000 031b 0000 315f 2c78 0030 0002 438a
2073660 2520 46d8 56f8 4af8 0000 0a0f 671c 332c 24d0 0000 0011 3528 0014 3d00 56f8 4af8 0000 0a7f 6d0c 723c 0010 61a8 0000 00e0
2073740 b27c b66c 0000 0830 0000 0926 0010 60a8 0200 0db5 0500 1cdd 0000 5827 0000 0013 0000 3287 0089 20c3 0000 031b 0000 315f
2074020 0010 60dc 0000 0038 b27c b66c 0000 0831 0000 0927 0010 0918 0200 0db5 0500 1cdd 0000 5bff 0000 0013 0000 3287 008a 3ee3
2074100 0000 031b 0000 315f 0010 6114 0000 0038 b27c b66c 0000 0873 0000 0969 0010 9638 0200 0db5 0500 1cdd 0000 5dcf 0000 0013
2074160 0000 3287 008a ef23 0000 031b 0000 315f 0010 61a8 0000 0038 b27c b66c 0000 07f1 0000 08e7 0010 61ac 0200 0db5 0500 1cdd
2074240 0000 55cf 0000 0013 0000 3287 0088 99c3 0000 031b 0000 315f 2c78 005c 0002 438a 2520 46ec 3348 247c 0011 1bd8 0018 2ba0
2074320 0018 000e 379c 3174 4a7c 000c 2c88 001c 2c58 340c 56f8 4af8 0000 000f 671c 3310 2430 0000 0011 1bd8 0014 2ba0 0014 000a
2074400 3774 4a7c 0010 723c 2c58 37f0 3cf4 234c 0011 1cfc 0010 63a8 0000 0070 b27c b66c 0000 07f2 0000 08e8 0010 61e4 0200 0db5
2074460 0500 1cdd 0000 5987 0000 0013 0000 3287 0089 8c43 0000 031b 0000 315f 0010 63a8 0000 0038 b27c b66c 0000 07f3 0000 08e9
2074540 0010 b75c 0200 0db5 0500 1cdd 0000 59af 0000 0013 0000 3287 0089 92c3 0000 031b 0000 315f 2954 002c 0002 438a 2520 46d8
2074620 332c 247c 0011 3580 0014 3d00 56f8 4af8 0000 0abf 671c 37dc 242c 0000 0011 1588 0011 b870 0000 0000 0012 7072 6f6d 7074
2074700 6564 5f63 6f6e 7374 616e 7473 0010 6210 000e 736b 6970 5f63 6f6e 7374 616e 7473 000f 1c9d 0008 e7ac 0200 511f 0000 510f
2074760 0000 0008 0010 6558 0010 a7f8 0001 005f 0000 0000 0008 e78c 0100 510f 0000 510f 0000 0004 0010 a8dc 0010 a9dc 0001 005f
2075040 0000 0000 000a 3a48 0000 0000 000f 89ac 0010 62b4 0010 6294 0200 510f 0000 510f 0000 0008 0010 6784 0010 6784 0001 005f
2075120 0000 0000 ffff ffff 0100 5127 0000 510f 0000 0004 0010 65f8 0010 a82c 0001 005f 0000 0000 0010 62e4 0200 5127 0000 510f
2075200 0000 0008 0010 6660 0010 a84c 0001 005f 0000 0000 0008 e7ec 0000 512f 0000 510f 0000 0000 0010 6c88 0010 6c88 0001 005f
2075260 0000 0000 0010 6324 0100 512f 0000 510f 0000 0004 0010 6c20 0010 6c20 0001 005f 0000 0000 0008 e80c 0100 5137 0000 510f
2075340 0000 0004 0010 a79c 0010 a9b8 0001 005f 0000 0000 0010 6364 0200 5137 0000 510f 0000 0008 0010 6b70 0010 a9d8 0001 005f
2075420 0000 0000 0010 6434 0000 0058 b288 b66c 0000 0702 7fff ffff 0010 a6d4 0200 0db5 0100 15ad 0100 33fd 0000 000b 0000 315f
2075500 0010 6434 0000 002c b288 b66c 0000 0702 7fff ffff 0010 63ac 0200 0db5 0100 15ad 0100 33fd 0000 000b 0000 315f 0000 0034
2075560 000b b478 b27c b66c 0000 0703 7fff ffff 0012 aa00 0200 0db5 0400 24ad 0000 2c0f 0000 000b 0000 510f 0000 2c0f 0000 315f
```

```
2075640  0010 6524 0000 009c b27c b66c 0000 0704 0000 071b 0010 649c 0200 0db5 0500 1cdd 0000 2def 0000 000b 0000 510f 0085 3363
2075720  0000 02fb 0000 315f 0010 6498 0000 002c b4f0 b4e4 0000 0703 7fff ffff 0008 b0dd 0000 0000 0000 0000 0010 6da4 0002 438a
2076000  0010 acac 0010 6524 0000 0038 b27c b66c 0000 0706 0000 071c 0010 6528 0200 0db5 0500 1cdd 0000 5117 0000 0013 0000 510f
2076060  0082 0863 0000 02fb 0000 315f 2c78 0052 0002 438a 2520 46d8 24d0 0000 0010 841c 001c 32b8 24d0 0000 0008 bafc 001c 42ac
2076140  0000 32a7 0008 e17c 001c 3364 329c 247c 0010 a788 001c 40a0 0010 a7a8 0018 408c 0008 e17c 0014 3100 4a7c 000c 723c 6c65
2076220  0010 65c4 0000 0038 b27c b66c 0000 0707 0000 071d 0010 65c8 0200 0db5 0500 1cdd 0000 511f 0000 0013 0000 510f 0083 1423
2076300  0000 02fb 0000 315f 27f0 0066 0010 a7f8 45e8 001c 46d8 39a4 0008 d75c 0020 2ecc 3af4 001c 0010 841c 001c 32b8 24d0 0000
2076360  0008 bafc 001c 42ac 0000 32a7 0008 e17c 001c 3484 4268 0000 0000 000b 332c 39a4 0010 a7e8 001c 40a0 0010 a7a8 0018 408c
2076440  0008 e17c 0014 3d00 4a7c 000c 723c 2c20 0013 662c 0000 0039 b27c b66c 0000 0708 0000 071e 0010 6630 0200 0db5 0500 1cdd
2076520  0000 5127 0000 000b 0000 510f 0083 17a3 0000 02fb 0000 315f 27f0 002e 0010 a82c 45b8 39a4 0008 d75c 0014 2ecc 3244 41fc
2076600  0000 000b 332c 39a4 0010 a7e8 0014 3d00 4a7c 000c 723c 2020 0010 66b4 0000 0038 b27c b66c 0000 0709 0000 071f 0010 66b8
2076660  0200 0db5 0500 1cdd 0000 5127 0000 0013 0000 510f 0083 18a3 0000 02fb 0000 315f 27f0 004e 0010 a94c 45dc 46d8 3b4c 0000
2076740  0008 d75c 001c 2ecc 32b8 247c 0008 bafc 001c 3aa0 0008 dcdc 0018 3244 4268 0000 0000 000b 332c 39a4 0010 a7e8 0018 408c
2077020  0008 e17c 0014 3d00 4a7c 000c 723c 6e65 0010 6718 0000 0038 b27c b66c 0000 070a 0000 0720 0010 671c 0200 0db5 0500 1cdd
2077100  0000 518f 0000 0023 0000 510f 0085 3f43 0000 02fb 0000 315f 2954 002c 0002 438a 56f8 5fa0 682c 5758 671c 6a00 47e4 3348
2077160  24d0 0000 0010 a788 001c 38e8 3a6c 2330 0010 a7e8 0010 67c4 0000 0070 b27c b66c 0000 070b 0000 0721 0010 6754 0200 0db5
2077240  0500 1cdd 0000 510f 0000 000b 0000 510f 0083 1523 0000 02fb 0000 315f 0010 67c4 0000 0038 b27c b66c 0000 070c 0000 0722
2077320  0010 67c8 0200 0db5 0500 1cdd 0000 510f 0000 0013 0000 510f 0083 16a3 0000 02fb 0000 315f 2c78 003a 0002 438a 45dc 46d8
2077400  32b8 247c 0008 bafc 001c 3aa0 0008 dcdc 0018 320c 329c 247c 0010 a788 0018 408c 0008 e17c 0014 3d00 4a7c 000c 723c 7574
2077460  0010 68f8 0000 0038 b27c b66c 0000 070d 0000 0723 0010 68fc 0200 0db5 0500 1cdd 0000 5197 0000 0013 0000 510f 0085 3c43
2077540  0000 02fb 0000 315f 2c78 00fc 0002 438a 45b8 4728 0020 32f0 001c 247c 0008 c1bc 0028 aa88 001c aab4 0000 a38c 000e 3774
2077620  4e1c 0000 0000 2147 723c aa88 001c aab4 0025 a1d0 0018 31f0 24d0 0000 0010 a91c 0028 382c 0020 2340 0010 a788 aa88 001c
2077700  aab4 0027 a1d0 002e 32f0 0024 24d0 0000 0008 c23c 0028 38fc 0020 33bc 382c 0024 3af4 001c 0010 a93c 0028 3d30 2420 0000
2077760  0008 b39c aa88 001c aab4 0022 a1d0 0026 32f0 0024 24d0 0000 0008 c23c 0028 38fc 0020 3844 3e70 0024 3df4 001c 242c 0000
2100040  0010 a93c 3894 0020 332c 411c 000c 001c 0010 a95c 001c 2e7c ae30 2ba0 001c 001c 37f0 32b8 24d0 0000 0008 d2dc 001c aa6c
2100120  2e98 3d0c 4a7c 000c 723c 2c58 3330 2340 0008 b39c 0010 69e4 0000 0038 b27c b66c 0000 070e 0000 0724 0010 69e8 0200 0db5
2100200  0500 1cdd 0000 519f 0000 001b 0000 510f 0085 4ae3 0000 02fb 0000 315f 2c78 00b4 0002 438a 45dc 4728 001c 4768 aa6c aab4
2100260  002c a1d0 0016 37b0 4a7c 0014 37c4 001c 4e1c 0000 0000 0007 723c aa6c aab4 0025 a1d0 0016 37c4 001c 4e1c 0000 0000 0007
2100340  379c 234c 0010 a91c aa6c aab4 0020 a554 0016 37b0 4a7c 0014 37c4 001c 4e1c 0000 0000 0007 723c aa6c aab4 007f a424 0020
2100420  aa6c aab4 00a0 a554 0016 37b0 4a7c 0014 37c4 001c 4e1c 0000 0000 0007 723c 37c4 001c 56f8 6d18 6a00 3280 247c 0008 c23c
2100500  0018 386c 37f0 3cf4 242c 0000 0010 a95c 0010 6b04 0000 0038 b27c b66c 0000 070f 0000 0725 0010 6b08 0200 0db5 0500 1cdd
2100560  0000 51a7 0000 0023 0000 510f 0085 49e3 0000 02fb 0000 315f 27f0 0040 000d b044 5d10 0000 0300 5ac7 4b8c 0000 0000 53df
2100640  671c 682c 4754 33d8 24d0 0000 0011 3cb0 0018 340c 56f8 4af8 0000 53df 6750 3858 2420 0000 0011 3cb0 27f0 007c 0010 6ad4
2100720  45dc 4a94 0018 4768 47a8 3050 329c 247c 0008 c23c 0024 aa34 aa6c a1d0 002c 379c 56f8 6d50 6af0 0020 32f0 001c 24d0 0000
2101000  0008 c23c 0024 38ac 3894 0020 3e70 001c 37b0 234c 0010 a93c aa34 aab4 0025 a1d0 0014 379c 4e1c 0000 0000 0007 2420 0000
2101060  0010 a91c 379c 4c70 0000 0007 3d00 4a7c 000c 723c 2954 002c 0002 438a 45b8 57b8 6b88 6a50 47e4 329c 24d0 0000 0008 c23c
2101140  001c 38e8 386c 3430 2420 0000 0010 a93c 0010 6bb4 0000 0070 b27c b66c 0000 0710 0000 0726 0010 6b40 0200 0db5 0500 1cdd
2101220  0000 5137 0000 000b 0000 510f 0083 1ba3 0000 02fb 0000 315f 0010 6bb4 0000 0038 b27c b66c 0000 0711 0000 0727 0010 6bb8
2101300  0200 0db5 0500 1cdd 0000 5137 0000 0013 0000 510f 0083 1ca3 0000 02fb 0000 315f 27f0 0040 0010 a9d8 45d0 46ec 9314 9a90
2101360  aa34 aab4 0000 a3ec 3050 3280 24d0 0000 0008 bafc 0018 3a4c 0008 dcdc 0014 39f8 0010 a890 0010 3cf4 242c 0000 0008 e17c
2101440  0010 6c54 0000 0070 b27c b66c 0000 0712 0000 0728 0010 6bf0 0200 0db5 0500 1cdd 0000 51af 0000 000b 0000 510f 0085 4483
2101520  0000 02fb 0000 315f 0010 6c54 0000 0038 b27c b66c 0000 0713 0000 0729 0010 6c58 0200 0db5 0500 1cdd 0000 512f 0000 000b
2101600  0000 510f 0083 1aa3 0000 02fb 0000 315f 2c78 0030 0002 438a 45c4 3280 24d0 0000 0008 bafc 0014 39f8 0008 dcdc 0010 247c
2101660  0010 6334 0010 3cf4 242c 0000 0008 e17c 0010 6d3c 0000 0038 b27c b66c 0000 0714 0000 072a 0010 6d40 0200 0db5 0500 1cdd
2101740  0000 512f 0000 0003 0000 510f 0083 19a3 0000 02fb 0000 315f 2c78 00b0 0002 438a 2520 3280 24d0 0000 0008 c1bc 001c aa18
2102020  aab4 0000 a38c 000a 242c 0000 0010 6334 aa18 aab4 0025 a1d0 0014 31f0 24d0 0000 0010 a91c 001c 234c 0010 6334 2ba0 001c
2102100  0064 aa18 aab4 0027 a1d0 0020 32d4 247c 0008 c23c 001c 3468 33bc 3818 3b4c 0000 0010 a93c 001c 2c88 003a aa18 aab4 0022
2102160  a1d0 0020 32d4 247c 0008 c23c 001c 3468 33bc 3d48 3b4c 0000 0010 a93c 0018 2c88 0012 3228 4768 320c 46ec 4064 0010 a95c
2102240  000c c5a8 2c58 22a0 0010 6da0 0000 0038 b27c b66c 0000 0715 0000 072b 0010 6da4 0200 0db5 0500 1cdd 0000 51b7 0000 000b
2102320  0000 510f 0085 48e3 0000 02fb 0000 315f 2c78 002c 0002 438a 45b8 247c 0008 dadc 0010 39a4 0008 c23c 0010 aa18 aab4 0020
2102400  a354 aa18 aab4 0009 a260 2eb0 0010 6eb8 0000 0038 b130 b66c 0000 0716 0000 072c 0010 6471 0200 0db5 0500 1cdd 0000 51bf
2102460  0000 000b 0000 510f 0085 3d43 0000 02fb 0000 315f 2c78 0048 0002 438a 2520 a858 aab4 0020 a38c 000e a858 aab4 0009 a2bc
2102540  0004 22a0 24d0 0000 0008 dadc 0010 3280 24d0 0000 0008 c23c 0010 aa18 aab4 0020 a354 aa18 aab4 0009 a260 2eb0 2c78 0098
2102620  0002 438a 45c4 46d8 2ba0 0020 0058 3788 56f8 4af8 0000 52b7 6750 3410 001c 32b8 24d0 0000 0011 144c 0020 2ba0 0020 000c
2102700  37c4 001c 4a7c 000c 723c 2c58 3df4 001c 56f8 4af8 0000 0a0f 6750 33f4 31f0 247c 0011 15dc 001c 3d18 56f8 4af8 0000 0a7f
```

```
2102760 6d0c 723c 2c30 001e 3788 56f8 4b8c 0000 0000 5287 6750 3844 31f0 4698 242c 0000 0011 144c 2c58 3788 56f8 4af8 0000 2ae7
2103040 6d0c 723c 0010 6ffc 0000 0038 b27c b66c 0000 0801 0000 08f7 0010 7000 0200 0db5 0500 1cdd 0000 5a17 0000 0013 0000 3287
2103120 0089 b7e3 0000 031b 0000 315f 2c78 010c 0002 438a 45c4 46d8 2ba0 0014 0010 3788 56f8 4af8 0000 52b7 6d0c 723c 2c30 0012
2103200 3788 56f8 4b8c 0000 0000 5237 6d0c 723c 2c30 0012 3788 56f8 4b8c 0000 0000 5287 6d0c 723c 2c30 0012 3788 56f8 4b8c 0000
2103260 0000 533f 6d0c 723c 2c30 0012 3788 56f8 4b8c 0000 0000 52c7 6d0c 723c 2c30 0012 3788 56f8 4b8c 0000 0000 532f 6d0c 723c
2103340 2c30 0012 3788 56f8 4b8c 0000 0000 53a7 6d0c 723c 2c30 0012 3788 56f8 4b8c 0000 0000 5387 6d0c 723c 2c30 0012 3788 56f8
2103420 4b8c 0000 0000 1ff7 6d0c 723c 2c30 0012 3788 56f8 4b8c 0000 0000 537f 6d0c 723c 2c30 0012 3788 56f8 4b8c 0000 0000 32e7
2103500 6d0c 723c 2c30 0012 3788 56f8 4b8c 0000 0000 527f 6d0c 723c 2c58 3788 56f8 4af8 0000 2627 6d0c 723c 0010 70cc 0000 0038
2103560 b27c b66c 0000 0802 0000 08f8 0010 70d0 0200 01b5 0500 1cdd 0000 599f 0000 0013 0000 3287 0089 8fc3 0000 031b 0000 315f
2103640 2c78 0098 0002 438a 2520 46d8 56f8 4af8 0000 52b7 6750 3410 0024 32b8 24d0 0000 0011 15dc 0028 31f4 0024 56f8 4b8c 0000
2103720 0000 25d7 6af0 0020 3bf4 0000 0011 3778 0024 37c4 0020 56f8 4b8c 0000 0000 52af 6af0 001c 2ba0 0020 0010 37c4 001c 318c
2104000 4a7c 0010 2c88 0020 2c58 33bc 382c 001c 32d4 247c 0011 1754 001c 3d48 40f4 0000 0011 1774 0014 3d00 56f8 4af8 0000 0ddf
2104060 6d0c 234c 0011 3798 0010 7e64 0000 0038 b27c b66c 0000 0803 0000 08f9 0010 7e68 0200 0db5 0500 1cdd 0000 5a2f 0000 0013
2104140 0000 3287 0089 bea3 0000 031b 0000 315f 2c78 0160 0002 438a 45b8 46ec 2ba0 0014 011c 37f0 3b4c 0000 0011 2180 0014 2ecc
2104220 4550 4af8 0000 0373 5370 4538 4b8c 0000 0000 037b 6bb4 4550 4b8c 0000 0000 034b 6b74 4538 4b8c 0000 0000 03a3 6bb4 4550
2104300 4b8c 0000 0000 030b 6b74 4538 4b8c 0000 0000 0393 6bb4 4550 4b8c 0000 0000 030b 6b74 4538 4b8c 0000 0000 0363 6bb4 4550
2104360 4b8c 0000 0000 031b 6b74 4538 4b8c 0000 0000 032b 6bb4 4550 4b8c 0000 0000 0323 6b74 4538 4b8c 0000 0000 02fb 6bb4 4550
2104440 4b8c 0000 0000 036b 6b74 4538 4b8c 0000 0000 030b 6bb4 4550 4b8c 0000 0000 0393 6b74 4538 4b8c 0000 0000 033b 6bb4 4550
2104520 4b8c 0000 0000 037b 6b74 4538 4b8c 0000 0000 0393 6bb4 4550 4b8c 0000 0000 0383 6b74 4538 4b8c 0000 0000 0313 6bb4 4550
2104600 4b8c 0000 0000 03ab 6b74 4538 4b8c 0000 0000 039b 6bb4 234c 0011 19bc 2c30 011a 37f0 39a4 0011 21a0 0014 2ecc 4550 4af8
2104660 0000 0373 5370 4538 4b8c 0000 0000 037b 6bb4 4550 4b8c 0000 0000 034b 6b74 4538 4b8c 0000 0000 03a3 6bb4 4550 4b8c 0000
2104740 0000 030b 6b74 4538 4b8c 0000 0000 0393 6bb4 4550 4b8c 0000 0000 030b 6b74 4538 4b8c 0000 0000 0363 6bb4 4550 4b8c 0000
2105020 0000 031b 6b74 4538 4b8c 0000 0000 032b 6bb4 4550 4b8c 0000 0000 0323 6b74 4538 4b8c 0000 0000 02fb 6bb4 4550 4b8c 0000
2105100 0000 036b 6b74 4538 4b8c 0000 0000 030b 6bb4 4550 4b8c 0000 0000 0393 6b74 4538 4b8c 0000 0000 033b 6bb4 4550 4b8c 0000
2105160 0000 037b 6b74 4538 4b8c 0000 0000 0393 6bb4 4550 4b8c 0000 0000 0383 6b74 4538 4b8c 0000 0000 0313 6bb4 4550 4b8c 0000
2105240 0000 03ab 6b74 4538 4b8c 0000 0000 039b 6bb4 234c 0011 19bc 2c30 011a 37f0 39a4 0011 2160 0014 2ecc 4550 4af8 0000 0373
2105320 5370 4538 4b8c 0000 0000 037b 6bb4 4550 4b8c 0000 0000 034b 6b74 4538 4b8c 0000 0000 03a3 6bb4 4550 4b8c 0000 0000 030b
2105400 6b74 4538 4b8c 0000 0000 0393 6bb4 4550 4b8c 0000 0000 030b 6b74 4538 4b8c 0000 0000 0363 6bb4 4550 4b8c 0000 0000 031b
2105460 6b74 4538 4b8c 0000 0000 032b 6bb4 4550 4b8c 0000 0000 0323 6b74 4538 4b8c 0000 0000 02fb 6bb4 4550 4b8c 0000 0000 036b
2105540 6b74 4538 4b8c 0000 0000 030b 6bb4 4550 4b8c 0000 0000 0393 6b74 4538 4b8c 0000 0000 033b 6bb4 4550 4b8c 0000 0000 037b
2105620 6b74 4538 4b8c 0000 0000 0393 6bb4 4550 4b8c 0000 0000 0383 6b74 4538 4b8c 0000 0000 0313 6bb4 4550 4b8c 0000 0000 03ab
2105700 6b74 4538 4b8c 0000 0000 039b 6bb4 234c 0011 19bc 2c30 011a 37f0 39a4 0011 21c0 0014 2ecc 4550 4af8 0000 0373 5370 4538
2105760 4b8c 0000 0000 037b 6bb4 4550 4b8c 0000 0000 034b 6b74 4538 4b8c 0000 0000 03a3 6bb4 4550 4b8c 0000 0000 030b 6b74 4538
2106040 4b8c 0000 0000 0393 6bb4 4550 4b8c 0000 0000 030b 6b74 4538 4b8c 0000 0000 0363 6bb4 4550 4b8c 0000 0000 031b 6b74 4538
2106120 4b8c 0000 0000 032b 6bb4 4550 4b8c 0000 0000 0323 6b74 4538 4b8c 0000 0000 02fb 6bb4 4550 4b8c 0000 0000 036b 6b74 4538
2106200 4b8c 0000 0000 030b 6bb4 4550 4b8c 0000 0000 0393 6b74 4538 4b8c 0000 0000 033b 6bb4 4550 4b8c 0000 0000 037b 6b74 4538
2106260 4b8c 0000 0000 0393 6bb4 4550 4b8c 0000 0000 0383 6b74 4538 4b8c 0000 0000 0313 6bb4 4550 4b8c 0000 0000 03ab 6b74 4538
2106340 4b8c 0000 0000 039b 6bb4 234c 0011 19bc 2c30 011a 37f0 39a4 0011 21e0 0014 2ecc 4550 4af8 0000 0373 5370 4538 4b8c 0000
2106420 0000 037b 6bb4 4550 4b8c 0000 0000 034b 6b74 4538 4b8c 0000 0000 03a3 6bb4 4550 4b8c 0000 0000 030b 6b74 4538 4b8c 0000
2106500 0000 0393 6bb4 4550 4b8c 0000 0000 030b 6b74 4538 4b8c 0000 0000 0363 6bb4 4550 4b8c 0000 0000 031b 6b74 4538 4b8c 0000
2106560 0000 032b 6bb4 4550 4b8c 0000 0000 0323 6b74 4538 4b8c 0000 0000 02fb 6bb4 4550 4b8c 0000 0000 036b 6b74 4538 4b8c 0000
2106640 0000 030b 6bb4 4550 4b8c 0000 0000 0393 6b74 4538 4b8c 0000 0000 033b 6bb4 4550 4b8c 0000 0000 037b 6b74 4538 4b8c 0000
2106720 0000 0393 6bb4 4550 4b8c 0000 0000 0383 6b74 4538 4b8c 0000 0000 0313 6bb4 4550 4b8c 0000 0000 03ab 6b74 4538 4b8c 0000
2107000 0000 039b 6bb4 234c 0011 19bc 2c30 011a 37f0 39a4 0011 2200 0014 2ecc 4550 4af8 0000 0373 5370 4538 4b8c 0000 0000 037b
2107060 6bb4 4550 4b8c 0000 0000 034b 6b74 4538 4b8c 0000 0000 03a3 6bb4 4550 4b8c 0000 0000 030b 6b74 4538 4b8c 0000 0000 0393
2107140 6bb4 4550 4b8c 0000 0000 030b 6b74 4538 4b8c 0000 0000 0363 6bb4 4550 4b8c 0000 0000 031b 6b74 4538 4b8c 0000 0000 032b
2107220 6bb4 4550 4b8c 0000 0000 0323 6b74 4538 4b8c 0000 0000 02fb 6bb4 4550 4b8c 0000 0000 036b 6b74 4538 4b8c 0000 0000 030b
2107300 6bb4 4550 4b8c 0000 0000 0393 6b74 4538 4b8c 0000 0000 033b 6bb4 4550 4b8c 0000 0000 037b 6b74 4538 4b8c 0000 0000 0393
2107360 6bb4 4550 4b8c 0000 0000 0383 6b74 4538 4b8c 0000 0000 0313 6bb4 4550 4b8c 0000 0000 03ab 6b74 4538 4b8c 0000 0000 039b
2107440 6bb4 234c 0011 19bc 2c30 011a 37f0 39a4 0011 2220 0014 2ecc 4550 4af8 0000 0373 5370 4538 4b8c 0000 0000 037b 6bb4 4550
2107520 4b8c 0000 0000 034b 6b74 4538 4b8c 0000 0000 03a3 6bb4 4550 4b8c 0000 0000 030b 6b74 4538 4b8c 0000 0000 0393 6bb4 4550
2107600 4b8c 0000 0000 030b 6b74 4538 4b8c 0000 0000 0363 6bb4 4550 4b8c 0000 0000 031b 6b74 4538 4b8c 0000 0000 032b 6bb4 4550
2107660 4b8c 0000 0000 0323 6b74 4538 4b8c 0000 0000 02fb 6bb4 4550 4b8c 0000 0000 036b 6b74 4538 4b8c 0000 0000 030b 6bb4 4550
2107740 4b8c 0000 0000 0393 6b74 4538 4b8c 0000 0000 033b 6bb4 4550 4b8c 0000 0000 037b 6b74 4538 4b8c 0000 0000 0393 6bb4 4550
2110020 4b8c 0000 0000 0383 6b74 4538 4b8c 0000 0000 0313 6bb4 4550 4b8c 0000 0000 03ab 6b74 4538 4b8c 0000 0000 039b 6bb4 234c
```

```
2110100 0011 19bc 2c30 011a 37f0 39a4 0011 15bc 0014 2ecc 4550 4af8 0000 0373 5370 4538 4b8c 0000 0000 037b 6bb4 4550 4b8c 0000
2110160 0000 034b 6b74 4538 4b8c 0000 0000 03a3 6bb4 4550 4b8c 0000 0000 030b 6b74 4538 4b8c 0000 0000 0393 6bb4 4550 4b8c 0000
2110240 0000 030b 6b74 4538 4b8c 0000 0000 0363 6bb4 4550 4b8c 0000 0000 031b 6b74 4538 4b8c 0000 0000 032b 6bb4 4550 4b8c 0000
2110320 0000 0323 6b74 4538 4b8c 0000 0000 02fb 6bb4 4550 4b8c 0000 0000 036b 6b74 4538 4b8c 0000 0000 030b 6bb4 4550 4b8c 0000
2110400 0000 0393 6b74 4538 4b8c 0000 0000 033b 6bb4 4550 4b8c 0000 0000 037b 6b74 4538 4b8c 0000 0000 0393 6bb4 4550 4b8c 0000
2110460 0000 0383 6b74 4538 4b8c 0000 0000 0313 6bb4 4550 4b9c 0000 0000 03ab 6b74 4538 4b8c 0000 0000 039b 6bb4 234c 0011 19bc
2110540 2c30 011a 37f0 39a4 0011 1a64 0014 2ecc 4550 4af8 0000 0373 5370 4538 4b8c 0000 0000 037b 6bb4 4550 4b8c 0000 0000 034b
2110620 6b74 4538 4b8c 0000 0000 03a3 6bb4 4550 4b8c 0000 0000 030b 6b74 4538 4b8c 0000 0000 0393 6bb4 4550 4b8c 0000 0000 030b
2110700 6b74 4538 4b8c 0000 0000 0363 6bb4 4550 4b8c 0000 0000 031b 6b74 4538 4b8c 0000 0000 032b 6bb4 4550 4b8c 0000 0000 0323
2110760 6b74 4538 4b8c 0000 0000 02fb 6bb4 4550 4b8c 0000 0000 036b 6b74 4538 4b8c 0000 0000 030b 6bb4 4550 4b8c 0000 0000 0393
2111040 6b74 4538 4b8c 0000 0000 033b 6bb4 4550 4b8c 0000 0000 037b 6b74 4538 4b8c 0000 0000 0393 6bb4 4550 4b8c 0000 0000 0383
2111120 6b74 4538 4b8c 0000 0000 0313 6bb4 4550 4b8c 0000 0000 03ab 6b74 4538 4b8c 0000 0000 039b 6bb4 234c 0011 19bc 2c30 011a
2111200 37f0 39a4 0011 1b78 0014 2ecc 4550 4af8 0000 0373 5370 4538 4b8c 0000 0000 037b 6bb4 4550 4b8c 0000 0000 034b 6b74 4538
2111260 4b8c 0000 0000 03a3 6bb4 4550 4b8c 0000 0000 030b 6b74 4538 4b8c 0000 0000 0393 6bb4 4550 4b8c 0000 0000 030b 6b74 4538
2111340 4b8c 0000 0000 0363 6bb4 4550 4b8c 0000 0000 031b 6b74 4538 4b8c 0000 0000 032b 6bb4 4550 4b8c 0000 0000 0323 6b74 4538
2111420 4b8c 0000 0000 02fb 6bb4 4550 4b8c 0000 0000 036b 6b74 4538 4b8c 0000 0000 030b 6bb4 4550 4b8c 0000 0000 0393 6b74 4538
2111500 4b8c 0000 0000 033b 6bb4 4550 4b8c 0000 0000 037b 6b74 4538 4b8c 0000 0000 0393 6bb4 4550 4b8c 0000 0000 0383 6b74 4538
2111560 4b8c 0000 0000 0313 6bb4 4550 4b8c 0000 0000 03ab 6b74 4538 4b8c 0000 0000 039b 6bb4 234c 0011 19bc 2c30 011a 37f0 39a4
2111640 0011 2280 0014 2ecc 4550 4af8 0000 0373 5370 4538 4b8c 0000 0000 037b 6bb4 4550 4b8c 0000 0000 034b 6b74 4538 4b8c 0000
2111720 0000 03a3 6bb4 4550 4b8c 0000 0000 030b 6b74 4538 4b8c 0000 0000 0393 6bb4 4550 4b8c 0000 0000 030b 6b74 4538 4b8c 0000
2112000 0000 0363 6bb4 4550 4b8c 0000 0000 031b 6b74 4538 4b9c 0000 0000 032b 6bb4 4550 4b8c 0000 0000 0323 6b74 4538 4b8c 0000
2112060 0000 02fb 6bb4 4550 4b8c 0000 0000 036b 6b74 4538 4b8c 0000 0000 030b 6bb4 4550 4b8c 0000 0000 0393 6b74 4538 4b8c 0000
2112140 0000 033b 6bb4 4550 4b8c 0000 0000 037b 6b74 4538 4b8c 0000 0000 0393 6bb4 4550 4b8c 0000 0000 0383 6b74 4538 4b8c 0000
2112220 0000 0313 6bb4 4550 4b8c 0000 0000 03ab 6b74 4538 4b8c 0000 0000 039b 6bb4 234c 0011 19bc 2c58 37f0 3b4c 0000 0011 22a0
2112300 000c 2ecc 4550 4af8 0000 0373 5370 4538 4b8c 0000 0000 037b 6bb4 4550 4b8c 0000 0000 034b 6b74 4538 4b8c 0000 0000 03a3
2112360 6bb4 4550 4b8c 0000 0000 030b 6b74 4538 4b8c 0000 0000 0393 6bb4 4550 4b8c 0000 0000 030b 6b74 4538 4b8c 0000 0000 0363
2112440 6bb4 4550 4b8c 0000 0000 031b 6b74 4538 4b8c 0000 0000 032b 6bb4 4550 4b8c 0000 0000 0323 6b74 4538 4b8c 0000 0000 02fb
2112520 6bb4 4550 4b8c 0000 0000 036b 6b74 4538 4b8c 0000 0000 030b 6bb4 4550 4b8c 0000 0000 0393 6b74 4538 4b8c 0000 0000 033b
2112600 6bb4 4550 4b8c 0000 0000 037b 6b74 4538 4b8c 0000 0000 0393 6bb4 4550 4b8c 0000 0000 0383 6b74 4538 4b8c 0000 0000 0313
2112660 6bb4 4550 4b8c 0000 0000 03ab 6b74 4538 4b8c 0000 0000 039b 6bb4 234c 0011 19bc 0010 7f38 0000 00a8 b27c b66c 0000 0804
2112740 0000 08fa 0010 7ea0 0200 0db5 0500 1cdd 0000 5a37 0000 0013 0000 3287 0089 c103 0000 031b 0000 315f 0010 7ed4 0000 0038
2113020 b27c b66c 0000 0805 0000 08fb 0010 7e48 0200 0db5 0500 1cdd 0000 5a3f 0000 0013 0000 3287 0089 c423 0000 031b 0000 315f
2113100 0010 7f38 0000 0038 b27c b66c 0000 0806 0000 08fc 0010 7f3c 0200 0db5 0500 1cdd 0000 5a47 0000 0013 0000 3287 0089 c8c3
2113160 0000 031b 0000 315f 2954 002c 0002 438a 2520 46d8 332c 247c 0011 3884 0014 3d00 56f8 4af8 0000 0abf 671c 37dc 242c 0000
2113240 0011 3918 0010 80b8 0000 0038 b27c b66c 0000 0807 0000 08fd 0010 80bc 0200 0db5 0500 1cdd 0000 5a4f 0000 0013 0000 3287
2113320 0089 cb43 0000 031b 0000 315f 2c78 0148 0002 438a 45d0 46ec 2ba0 0018 000e 379c 3174 4a7c 000c 2c88 0112 2c58 3310 3a4c
2113400 0011 2390 0014 4538 4b8c 0000 0000 032b 5370 4550 4b8c 0000 0000 039b 6b74 4538 4b8c 0000 0000 03ab 6bb4 4550 4b8c 0000
2113460 0000 030b 6b74 4538 4b8c 0000 0000 0363 6bb4 4550 4b8c 0000 0000 031b 6b74 4538 4b8c 0000 0000 02fb 6bb4 4550 4b8c 0000
2113540 0000 031b 6b74 4538 4b8c 0000 0000 034b 6bb4 4550 4b8c 0000 0000 0393 6b74 4538 4b8c 0000 0000 032b 6bb4 4550 4b8c 0000
2113620 0000 0373 6b74 4538 4b8c 0000 0000 032b 6bb4 4550 4b8c 0000 0000 033b 6b74 4538 4b8c 0000 0000 02fb 6bb4 4550 4b8c 0000
2113700 0000 0363 6b74 4538 4b8c 0000 0000 030b 6bb4 4550 4b8c 0000 0000 036b 6b74 4538 4b8c 0000 0000 0393 6bb4 4550 4b8c 0000
2113760 0000 037b 6b74 4538 4b8c 0000 0000 0333 6bb4 247c 0011 19bc 0014 2ba0 0014 000a 3774 4a7c 0010 723c 2c58 37f0 3cf4 234c
2114040 0011 23b0 0010 8130 0000 0038 b27c b66c 0000 0808 0000 08fe 0010 8134 0200 0db5 0500 1cdd 0000 5a57 0000 0013 0000 3287
2114120 0089 cd63 0000 031b 0000 315f 2c78 0040 0002 438a 45c4 46d8 2ba0 0014 000c 37dc 3788 234c 0011 3918 2c30 0012 3788 56f8
2114200 4b8c 0000 0000 531f 6d0c 723c 2c58 3788 56f8 4af8 0000 1ccf 6d0c 723c 0010 8194 0000 0038 b27c b66c 0000 0809 0000 08ff
2114260 0010 8198 0200 0db5 0500 1cdd 0000 5707 0000 0013 0000 3287 0088 dcc3 0000 031b 0000 315f 2c78 002c 0002 438a 2520 46d8
2114340 332c 247c 0011 3a00 0014 3d00 56f8 4af8 0000 0daf 671c 37dc 242c 0000 0011 36fc 0010 81f8 0000 0038 b27c b66c 0000 080a
2114420 0000 0900 0010 81fc 0200 0db5 0500 1cdd 0000 5a67 0000 0013 0000 3287 0089 d1a3 0000 031b 0000 315f 2c78 002c 0002 438a
2114500 45b8 46ec 2ba0 0014 0008 2330 0011 2920 2c30 000a 2410 0000 0010 a4a4 2c58 2330 0011 2aa4 0010 8354 0000 0038 b27c b66c
2114560 0000 080b 0000 0901 0010 8358 0200 0db5 0500 1cdd 0000 5a6f 0000 0013 0000 3287 0089 d3e3 0000 031b 0000 315f 2954 0124
2114640 0002 438a 2520 46ec 3310 247c 0011 3a34 0014 37f0 40cc 0000 0011 3a7c 000c 4538 4b8c 0000 0000 03a3 5370 4550 4b8c 0000
2114720 0000 0393 6b74 4538 4b8c 0000 0000 030b 6bb4 4550 4b8c 0000 0000 0383 6b74 4538 4b8c 0000 0000 02fb 6bb4 4550 4b8c 0000
2115000 0000 03a3 6b74 4538 4b8c 0000 0000 0373 6bb4 4550 4b8c 0000 0000 032b 6b74 4538 4b8c 0000 0000 036b 6bb4 4550 4b8c 0000
2115060 0000 032b 6b74 4538 4b8c 0000 0000 03a3 6bb4 4550 4b8c 0000 0000 030b 6b74 4538 4b8c 0000 0000 03a3 6bb4 4550 4b8c 0000
2115140 0000 039b 6b74 4538 4b8c 0000 0000 02fb 6bb4 4550 4b8c 0000 0000 03cb 6b74 4538 4b8c 0000 0000 03a3 6bb4 4550 4b8c 0000
```

```
2115220 0000 034b 6b74 4538 4b8c 0000 0000 03a3 6bb4 4550 4b8c 0000 0000 0373 6b74 4538 4b8c 0000 0000 032b 6bb4 234c 0011 3abc
2115300 0010 851c 0000 0038 b27c b66c 0000 030c 0000 0902 0010 97c4 0200 0db5 0500 1cdd 0000 5a7f 0000 0013 0000 3287 0089 d7a3
2115360 0000 031b 0000 315f 2cac 0000 0002 438a 2ca0 0974 0000 0000 0000 0000 0011 3d64 0010 3880 0010 f160 0011 3d78 000d 7072
2115440 6f6d 7074 6564 5f63 6861 7200 000d 7072 6f61 7074 6564 5f6c 696e 6500 0000 5157 b328 2e18 000a 2e1c 0000 0000 0000 510f
2115520 b328 af5d 0010 a724 0000 0000 0000 5157 b328 0000 000a 2e74 0000 0000 0000 2c0f b328 8404 00ca 2ee0 0000 0000 000f 55e0
2115600 0100 2c0f 0000 2c0f 0000 0004 0010 3274 0010 3274 0001 0060 0000 0000 0009 e84c 0200 515f 0000 2c0f 0000 0008 0010 3360
2115660 0010 336c 0001 0060 c000 0000 0000 515f b328 34ac 000a 28fc 0000 0000 ffff ffff 0200 5167 0000 2c0f 0000 0008 0010 a67c
2115740 0010 a67c 0001 0060 0000 0000 0000 5167 b464 2665 000a 2930 000f d6dc 0010 845c 0300 5167 0000 2c0f 0000 000c 0010 a6a4
2116020 0010 a6a4 0001 0060 0000 0000 0000 002c 0010 b35c b27c b66c 0000 073b 7fff ffff 0010 43ec 0200 0db5 0200 2f35 0000 5207
2116100 0000 0313 0000 315f 0000 002c 0010 b338 b27c b66c 0000 0773 7fff ffff 0010 4418 0200 0db5 0200 224d 0000 5207 0000 3287
2116160 0000 315f 0010 6162 7374 7261 6374 5f6c 6974 6572 616c 0000 0010 8614 0000 00c8 b27c b66c 0000 073d 0000 0772 000a d16d
2116240 0200 0db5 0200 270d 0000 5207 0000 3287 0000 315f 0010 8580 0000 0038 b27c b66c 0000 073e 0000 0774 0010 85b0 0200 0db5
2116320 0500 1cdd 0000 53ef 0000 001b 0000 3287 0085 6943 0000 0313 0000 315f 0010 85ac 0000 002c b4f0 b4e4 0000 073d 7fff ffff
2116400 0008 b0dd 0000 0000 0000 0000 0010 9b40 0002 438a 0010 f2ec 0010 8614 0000 0038 b27c b66c 0000 073f 0000 0775 0010 8618
2116460 0200 0db5 0500 1cdd 0000 5407 0000 001b 0000 3287 0086 9d63 0000 0313 0000 315f 2c78 0030 0002 438a 45d0 3574 4754 3364
2116540 24d0 0000 0010 d3cc 001c 33a0 3448 3a4c 0010 d3ec 0014 37f0 3cf4 234c 0010 d40c 0010 8694 0000 0038 b27c b66c 0000 0740
2116620 0000 0776 0010 8698 0200 0db5 0500 1cdd 0000 5417 0000 001b 0000 3287 0086 9f63 0000 0313 0000 315f 27f0 0048 0010 d490
2116700 56f8 687c 001c 69b0 3574 4768 3380 0020 24d0 0000 0010 d43c 0024 33f4 3e70 0020 3af4 001c 0010 d45c 001c 2ecc 332c 40a0
2116760 0010 d3cc 0018 386c 3d30 2340 0010 d3ec c010 8704 0000 0038 b27c b66c 0000 0741 0000 0777 0010 8708 0200 0db5 0500 1cdd
2117040 0000 5427 0000 0013 0000 3287 0086 a1e3 0000 0313 0000 315f 27f0 0038 000f d5bc 2520 46ec 56f8 4af8 0000 016b 55f0 4af8
2117120 0000 016b 6750 3950 33a0 31f0 24d0 0000 0010 d4d8 0014 37f0 3cf4 234c 0010 d4f8 0010 87e4 0000 00a8 b27c b66c 0000 0742
2117200 0000 0778 0010 8740 0200 0db5 0500 1cdd 0000 5437 0000 001b 0000 3287 0086 a6c3 0000 0313 0000 315f 0010 8774 0000 0038
2117260 b27c b66c 0000 0743 0000 0779 0010 8778 0200 0db5 c500 1cdd 0000 542f 0000 001b 0000 3287 0086 a2e3 0000 0313 0000 315f
2117340 0010 87e4 0000 0038 b27c b66c 0000 0744 0000 077a 0010 87e8 0200 0db5 0500 1cdd 0000 337f 0000 001b 0000 3287 0086 b163
2117420 0000 0313 0000 315f 2c78 0038 0002 438a 56f8 687c 001c 69b0 4768 33bc 32d4 247c 0010 d6ac 0020 2ecc 382c 001c 4108 0000
2117500 000c 6814 0018 386c 3d30 2340 0010 d6cc 0010 8894 0000 00a8 b27c b66c 0000 0745 0000 077b 0010 8820 0200 0db5 0500 1cdd
2117560 0000 5467 0000 001b 0000 3287 0086 b563 0000 0313 0000 315f 0010 8854 0000 0038 b27c b66c 0000 0746 0000 077c 0010 8898
2117640 0200 0db5 0500 1cdd 0000 20df 0000 001b 0000 3287 0086 b923 0000 0313 0000 315f 0010 8894 0000 0038 b27c b66c 0000 074f
2117720 0000 0785 0010 8b9c 0200 0db5 0500 1cdd 0000 5497 0000 0013 0000 3287 0086 ca03 0000 0313 0000 315f 0002 3d3e 000e 6c61
2120000 0010 89c8 0000 0070 b27c b66c 0000 0747 0000 c77d 0010 88d0 0200 0db5 0500 1cdd 0000 5477 0000 001b 0000 3287 0086 a9c3
2120060 0000 0313 0000 315f 0010 89c8 0000 0038 b27c b66c 0000 0748 0000 077e 0010 89cc 0200 0db5 0500 1cdd 0000 546f 0000 001b
2120140 0000 3287 0086 b663 0000 0313 0000 315f 27f0 004c c010 894c 56f8 671c 55f0 687c 001c 69b0 4768 3410 0020 247c 0010 d538
2120220 0024 33bc 3e70 0020 32d4 247c 0010 d6ac 0020 2ecc 382c 001c 4108 0000 000c 6814 0018 386c 3d30 2340 0010 d6cc 28c4 0038
2120300 0010 8984 56f8 687c 001c 69b0 4768 33bc 32d4 247c 0010 d6ac 0020 2ecc 382c 001c 4108 0000 000c 6814 0018 386c 3d30 2340
2120360 0010 d6cc 28c4 0040 0010 d7b0 56f8 671c 55f0 6868 69b0 4768 3410 001c 24d0 0000 0010 d538 0020 33bc 3e70 001c 3c48 0000
2120440 0010 d724 0018 2ecc 386c 3d30 2420 c000 0010 d6cc 0010 8b98 0000 0188 b27c b66c 0000 0749 0000 077f 0010 8a04 0200 0db5
2120520 0500 1cdd 0000 5457 0000 0013 0000 3287 0086 b263 0000 0313 0000 315f 0010 8a38 c000 0038 b27c b66c 0000 074a 0000 0780
2120600 0010 8a3c 0200 0db5 0500 1cdd 0000 547f 0000 0013 0000 3287 0086 c1a3 0000 0313 0000 315f 0010 8a70 0000 0038 b27c b66c
2120660 0000 074b 0000 0781 0010 8a74 0200 0db5 0500 1cdd 0000 540f 0000 0013 0000 3287 0086 9e63 0000 0313 0000 315f 0010 8aa8
2120740 0000 0038 b27c b66c 0000 074c 0000 0782 0010 8aac 0200 0db5 0500 1cdd 0000 5487 0000 0013 0000 3287 0086 c563 0000 0313
2121020 0000 315f 0010 8ae0 0000 0038 b27c b66c 0000 074d 0000 0783 0010 8ae4 0200 0db5 0500 1cdd 0000 548f 0000 0013 0000 3287
2121100 0086 c7e3 0000 0313 0000 315f 0010 8b18 0000 0038 b27c b66c 0000 074e 0000 0784 0010 8858 0200 0db5 0500 1cdd 0000 549f
2121160 0000 0013 0000 3287 0086 cde3 0000 0313 0000 315f 0010 8b98 0000 0038 b27c b66c 0000 0875 0000 096b 0010 9468 0200 0db5
2121240 0500 1cdd 0000 5c87 0000 0013 0000 3287 008a 75c3 0000 031b 0000 315f 28c4 003c 0010 e544 56f8 6868 69b0 4768 3410 001c
2121320 31f0 247c 0010 d534 0020 2ecc 33bc 3e70 001c 3aa0 0010 e450 0018 2ecc 386c 3d30 2420 0000 0010 e470 2b24 0000 0002 438a
2121400 0010 8b56 0010 8cc8 0000 00a8 b27c b66c 0000 0750 0000 0786 0010 8bd4 0200 0db5 0500 1cdd 0000 543f 0000 0013 0000 3287
2121460 0086 a7c3 0000 0313 0000 315f 0010 8c08 0000 0038 b27c b66c 0000 0751 0000 0787 0010 8c0c 0200 0db5 0500 1cdd 0000 545f
2121540 0000 001b 0000 3287 0086 b3e3 0000 0313 0000 315f 0010 8cc8 0000 0038 b27c b66c 0000 0752 0000 0788 0010 8ccc 0200 0db5
2121620 0500 1cdd 0000 544f 0000 001b 0000 3287 0086 af63 0000 0313 0000 315f 0005 636f 756e 7400 0010 de10 000b 6711 0000 0000
2121700 0000 0000 0010 ddf0 0010 dbb8 0000 0000 0010 dd50 0000 0000 0000 0000 0000 0000 0000 0000 0000 0000 0000 0000 0000 0000
2121760 0010 dc90 0010 dcb0 0010 db30 0000 0000 0000 0000 0000 0000 000e 418d 000b 67b9 000e 411d 0010 dc28 0000 0000 000b 6719
2122040 0010 dd90 0010 ddb0 0000 0000 0010 dd10 0010 dc70 0010 8e5c 0000 0038 b27c b66c 0000 0753 0000 0789 0010 8e60 0200 0db5
2122120 0500 1cdd 0000 54cf 0000 001b 0000 3287 0086 f2a3 0000 0313 0000 315f 27f0 006c 0010 8d68 5d10 0000 0500 54cf 671c 687c
2122200 001c 6af0 0020 6a00 69b0 477c 3410 0024 24d0 0000 0010 df54 0028 3df4 0024 56f8 4b8c 0000 0000 0173 6784 3468 382c 0020
2122260 3af4 001c 0010 df74 001c 3880 343c 39f8 0010 df94 0010 37dc 4240 0000 0000 53ff 242c 0000 0010 dfb4 28c4 0050 0010 8db8
```

| | | | | | | | | | | | | | | | | | | | | | | | | |
|---|---|---|---|---|---|---|---|---|---|---|---|---|---|---|---|---|---|---|---|---|---|---|---|---|
| 2122340 | 5d10 | 0000 | 0500 | 54cf | 671c | 4af8 | 0000 | 0003 | 4b8c | 0000 | 0000 | 0003 | 6840 | 69b0 | 477c | 33d8 | 24d0 | 0000 | 0010 | df54 | 001c | 3880 | 3d3c | 39f8 |
| 2122420 | 0010 | df94 | 0010 | 37dc | 4240 | 0000 | 0000 | 53ff | 242c | 0000 | 0010 | dfb4 | 28c4 | 005c | 0010 | 8e14 | 5d10 | 0000 | 0500 | 54cf | 671c | 6840 | 6a50 | 4af8 |
| 2122500 | 0000 | 0003 | 69b0 | 477c | 3410 | 001c | 24d0 | 0000 | 0010 | df54 | 0020 | 3df4 | 001c | 56f8 | 4b8c | 0000 | 0000 | 0173 | 6784 | 38e8 | 3804 | 39f0 | 0010 | df74 |
| 2122560 | 0010 | 37dc | 4240 | 0000 | 0000 | 53ff | 242c | 0000 | 0010 | dfb4 | 2954 | 0044 | 0002 | 438a | 5d10 | 0000 | 0500 | 54cf | 671c | 4af8 | 0000 | 0003 | 4b8c | 0000 |
| 2122640 | 0000 | 0003 | 4b8c | 0000 | 0000 | 0003 | 682c | 247c | 0010 | df54 | 0010 | 37dc | 4240 | 0000 | 0000 | 53ff | 242c | 0000 | 0010 | dfb4 | 0010 | 8f40 | 0000 | 00a8 |
| 2122720 | b27c | b66c | 0000 | 0754 | 0000 | 078a | 0010 | 8e98 | 0200 | 0db5 | 0500 | 1cdd | 0000 | 2537 | 0000 | 001b | 0000 | 3287 | 0086 | faa3 | 0000 | 0313 | 0000 | 315f |
| 2123000 | 0010 | 8ecc | 0000 | 0038 | b27c | b66c | 0000 | 0755 | 0000 | 078b | 0010 | 8ed0 | 0200 | 0db5 | 0500 | 1cdd | 0000 | 253f | 0000 | 001b | 0000 | 3287 | 0087 | 01c3 |
| 2123060 | 0000 | 0313 | 0000 | 315f | 0010 | 8f40 | 0000 | 0038 | b27c | b66c | 0000 | 0756 | 0000 | 078c | 0010 | 8f44 | 0200 | 0db5 | 0500 | 1cdd | 0000 | 54ff | 0000 | 001b |
| 2123140 | 0000 | 3287 | 0087 | 0483 | 0000 | 0313 | 0000 | 315f | 28c4 | 003c | 0010 | e128 | 56f8 | 6868 | 69b0 | 4768 | 3410 | 001c | 31f0 | 247c | 0010 | d538 | 0020 | 2ecc |
| 2123220 | 33bc | 3e70 | 001c | 3aa0 | 0010 | d724 | 0018 | 2ecc | 386c | 3d30 | 2420 | 0000 | 0010 | e090 | 0010 | 8fc4 | 0000 | 0038 | b27c | b66c | 0000 | 0757 | 0000 | 078d |
| 2123300 | 0010 | 8fc8 | 0200 | 0db5 | 0500 | 1cdd | 0000 | 229f | 0000 | 0023 | 0000 | 3287 | 0086 | fba3 | 0000 | 0313 | 0000 | 315f | 2c78 | 004c | 0002 | 438a | 45c4 | 46d8 |
| 2123360 | 35ec | 3664 | 32b8 | 247c | 0010 | e160 | 0018 | 3d3c | 3ba0 | 0000 | 0008 | cefc | 0010 | 39a4 | 0010 | e180 | 000c | 43e4 | 0100 | 550f | 5fa0 | 43c0 | 0200 | 0daf |
| 2123440 | 4b8c | 0000 | 0000 | 3287 | 6bb4 | 234c | 0008 | db5c | 0010 | 9074 | 0000 | 0038 | b27c | b66c | 0000 | 0758 | 0000 | 078e | 0010 | 9078 | 0200 | 0db5 | 0500 | 1cdd |
| 2123520 | 0000 | 5507 | 0000 | 001b | 0000 | 3287 | 0087 | 0b03 | 0000 | 0313 | 0000 | 315f | 27f0 | 0030 | 0010 | 9028 | 56f8 | 671c | 682c | 4768 | 33bc | 247c | 0010 | d724 |
| 2123600 | 0018 | 2ecc | 38d4 | 3d60 | 4254 | 0000 | 0000 | 000b | 2420 | 0000 | 0010 | e1b0 | 2954 | 0048 | 0002 | 438a | 56f8 | 671c | 5fa0 | 2520 | 24d0 | 0000 | 0010 | d6ac |
| 2123660 | 0010 | 3310 | 4300 | 0000 | 0000 | 53ff | 0010 | dfb4 | 0010 | 247c | 0010 | e1f8 | 0010 | 4064 | 0008 | ec1c | 000c | 247c | 0008 | d13c | 000c | 234c | 0008 | b05c |
| 2123740 | 0010 | 9170 | 0000 | 0038 | b27c | b66c | 0000 | 089b | 0000 | 0991 | 000f | 79b0 | 0200 | 0db5 | 0500 | 1cdd | 0000 | 5dff | 0000 | 0013 | 0000 | 3287 | 008b | 0923 |
| 2124020 | 0000 | 031b | 0000 | 315f | 27f0 | 0034 | 0010 | 90dc | 56f8 | 671c | 682c | 4714 | 35ec | 47d0 | 33bc | 247c | 0010 | d724 | 001c | aa6c | aaf0 | 0001 | ac4c | 2ecc |
| 2124100 | 38d4 | 3d60 | 2420 | 0000 | 0010 | e1b0 | 28c4 | 0050 | 0010 | 912c | 56f8 | 687c | 001c | 69b0 | 4714 | 35ec | 47d0 | 3410 | 0020 | 31f0 | 24d0 | 0000 | 0010 | d538 |
| 2124160 | 0024 | 2ecc | 33bc | 3e70 | 0020 | 3c9c | 0000 | 001c | 0010 | d724 | 001c | aa6c | aaf0 | 0001 | ac4c | 2ecc | 38d4 | 3d60 | 2420 | 0000 | 0010 | e1b0 | 2954 | 003e |
| 2124240 | 0002 | 438a | 4e1c | 0000 | 0000 | 0007 | 2520 | 4754 | 47a8 | 4408 | 0100 | 550f | 6b88 | 43c0 | 0200 | 0daf | 4b8c | 0000 | 0000 | 3287 | 6bf4 | 247c | 0008 | b2bc |
| 2124320 | 0014 | 3788 | 4a7c | 000c | 723c | 34ac | 0010 | 93bc | 0000 | 0070 | b27c | b66c | 0000 | 089a | 0000 | 0990 | 0010 | 9078 | 0200 | 0db5 | 0500 | 1cdd | 0000 | 579f |
| 2124400 | 0000 | 0013 | 0000 | 3287 | 0089 | 0043 | 0000 | 031b | 0000 | 315f | 0010 | 93bc | 0000 | 0038 | b27c | b66c | 0000 | 0898 | 0000 | 098e | 000f | 9c1c | 0200 | 0db5 |
| 2124460 | 0500 | 1cdd | 0000 | 56a7 | 0000 | 0013 | 0000 | 3287 | 0088 | c823 | 0000 | 031b | 0000 | 315f | 27f0 | 0094 | 0010 | 9270 | 5d10 | 0000 | 0500 | 54d7 | 671c | 687c |
| 2124540 | 0024 | 6af0 | 001c | 6a00 | 69b0 | 4768 | 3410 | 0028 | 2440 | 0000 | 0010 | e2f0 | 002c | 3df4 | 0028 | 56f8 | 4b8c | 0000 | 0000 | 011b | 6750 | 3410 | 0020 | 3c9c |
| 2124620 | 0000 | 0024 | 0010 | e310 | 0024 | 3df4 | 0020 | 56f8 | 4b8c | 0000 | 0000 | 0173 | 6750 | 33f4 | 3af4 | 001c | 0010 | e310 | 001c | 3d18 | 56f8 | 4af8 | 0000 | 011b |
| 2124700 | 6750 | 386c | 3ba0 | 0000 | 0010 | df94 | 0010 | 37dc | 4240 | 0000 | 0000 | 53ff | 242c | 0000 | 0010 | dfb4 | 28c4 | 0084 | 0010 | 92f4 | 5d10 | 0000 | 0400 | 54d7 |
| 2124760 | 671c | 687c | 0020 | 6aa0 | 69b0 | 4754 | 3410 | 0024 | 24d0 | 0000 | 0010 | e2f0 | 0028 | 3df4 | 0024 | 56f8 | 4b8c | 0000 | 0000 | 011b | 6750 | 3410 | 001c | 3c9c |
| 2125040 | 0000 | 0020 | 0010 | e310 | 0020 | 3df4 | 001c | 56f8 | 4b8c | 0000 | 0000 | 0173 | 6750 | 33d8 | 3c48 | 0000 | 0010 | e310 | 0018 | 3d0c | 56f8 | 4af8 | 0000 | 011b |
| 2125120 | 6d50 | 37dc | 4240 | 0000 | 0000 | 53ff | 242c | 0000 | 0010 | dfb4 | 28c4 | 0070 | 0010 | 9364 | 5d10 | 0000 | 0400 | 54d7 | 671c | 687c | 001c | 6a00 | 69b0 | 4768 |
| 2125200 | 3410 | 0020 | 24d0 | 0000 | 0010 | e2f0 | 0024 | 3df4 | 0020 | 56f8 | 4b8c | 0000 | 0000 | 011b | 6750 | 33f4 | 3af4 | 001c | 0010 | e310 | 001c | 3d18 | 56f8 | 4af8 |
| 2125260 | 0000 | 011b | 6750 | 386c | 3ba0 | 0000 | 0010 | df94 | 0010 | 37dc | 4240 | 0000 | 0000 | 53ff | 242c | 0000 | 0010 | dfb4 | 2954 | 0054 | 0002 | 438a | 5d10 | 0000 |
| 2125340 | 0300 | 54d7 | 671c | 6968 | 69b0 | 4754 | 3410 | 001c | 24d0 | 0000 | 0010 | e2f0 | 0020 | 33d8 | 3e70 | 001c | 3c48 | 0000 | 0010 | e310 | 0018 | 3d0c | 56f8 | 4af8 |
| 2125420 | 0000 | 011b | 6d50 | 37dc | 4240 | 0000 | 0000 | 53ff | 242c | 0000 | 0010 | dfb4 | 0010 | 942c | 0000 | 0038 | b27c | b66c | 0000 | 0897 | 0000 | 098d | 0010 | 91ac |
| 2125500 | 0200 | 0db5 | 0500 | 1cdd | 0000 | 56df | 0000 | 001b | 0000 | 3287 | 0088 | d423 | 0000 | 031b | 0000 | 315f | 2c78 | 0038 | 0002 | 438a | 45b8 | 46ec | 2ba0 | 0014 |
| 2125560 | 0008 | 2330 | 0011 | 5eb8 | 2c30 | 000a | 2410 | 0000 | 0011 | 28ac | 2c30 | 000a | 2410 | 0000 | 0011 | 13ac | 2c58 | 2330 | 0011 | 3ec8 | 0010 | 9524 | 0000 | 0070 |
| 2125640 | b27c | b66c | 0000 | 0896 | 0000 | 098c | 0010 | 93c0 | 0200 | 01b5 | 0500 | 1cdd | 0000 | 5b37 | 0000 | 0013 | 0000 | 3287 | 008a | 0743 | 0000 | 031b | 0000 | 315f |
| 2125720 | 0010 | 9524 | 0000 | 0038 | b27c | b66c | 0000 | 0876 | 0000 | 096c | 000d | b15c | 0200 | 0db5 | 0500 | 1cdd | 0000 | 5de7 | 0000 | 0013 | 0000 | 3287 | 008a | f943 |
| 2126000 | 0000 | 031b | 0000 | 315f | 2954 | 0040 | 0002 | 438a | 2520 | 46ec | 3348 | 247c | 0011 | 3410 | 0018 | 2ba0 | 0018 | 000e | 379c | 3174 | 4a7c | 000c | 2c88 | 0010 |
| 2126060 | 2c58 | 3310 | 40f4 | 0000 | 0011 | 1cdc | 0014 | 37f0 | 3cf4 | 234c | 0011 | 33d0 | 2c78 | 0048 | 0002 | 438a | 2520 | 46d8 | 56f8 | 4af8 | 0000 | 528f | 671c | 3348 |
| 2126140 | 24d0 | 0000 | 0011 | 3490 | 0018 | 3d0c | 56f8 | 4af8 | 0000 | 1cbf | 6750 | 33bc | 31f0 | 247c | 0011 | 142c | 0014 | 3d00 | 56f8 | 4af8 | 0000 | 0ddf | 6d0c | 723c |
| 2126220 | 0010 | 9634 | 0000 | 0070 | b27c | b66c | 0000 | 07f9 | 0000 | 08ef | 0010 | 9560 | 0200 | 0db5 | 0500 | 1cdd | 0000 | 5887 | 0000 | 001b | 0000 | 3287 | 0089 | a583 |
| 2126300 | 0000 | 031b | 0000 | 315f | 0010 | 9634 | 0000 | 0038 | b27c | b66c | 0000 | 07fa | 0000 | 08f0 | 0010 | 99f4 | 0200 | 0db5 | 0500 | 1cdd | 0000 | 59ef | 0000 | 0013 |
| 2126360 | 0000 | 3287 | 0089 | a943 | 0000 | 031b | 0000 | 315f | 0011 | b830 | 0000 | 0000 | 2c78 | 0038 | 0002 | 438a | 45b8 | 46ec | 2ba0 | 0014 | 0008 | 2330 | 0011 | 3be0 |
| 2126440 | 2c30 | 000a | 2410 | 0000 | 0011 | 4960 | 2c30 | 000a | 2410 | 0000 | 0011 | 3f3c | 2c58 | 2330 | 0011 | 5700 | 2c78 | 0060 | 0002 | 438a | 5d10 | 0000 | 0200 | 54df |
| 2126520 | 682c | 6a50 | 3574 | 477c | 56f8 | 4af8 | 0000 | 013b | 6750 | 3050 | 3410 | 001c | 329c | 247c | 0010 | d580 | 0020 | 3df4 | 001c | 56f8 | 4b8c | 0000 | 0000 | 013b |
| 2126600 | 6dd8 | 3804 | 4300 | 0000 | 0000 | 53ff | 0010 | dfb4 | 0014 | 4550 | 6d50 | 5370 | 2420 | 0000 | 0008 | cefc | 0010 | 9704 | 0000 | 0038 | b27c | b66c | 0000 | 0874 |
| 2126660 | 0000 | 096a | 0010 | 8b1c | 0200 | 0db5 | 0500 | 1cdd | 0000 | 5ddf | 0000 | 0013 | 0000 | 3287 | 008a | f5c3 | 0000 | 031b | 0000 | 315f | 2c78 | 0060 | 0002 | 438a |
| 2126740 | 5d10 | 0000 | 0300 | 5547 | 671c | 6868 | 69b0 | 4754 | 3410 | 001c | 2410 | 0000 | 0010 | e5d0 | 0020 | 2ecc | 3df4 | 001c | 56f8 | 4af8 | 0000 | 0113 | 6750 | 33d8 |
| 2127020 | 3c48 | 0000 | 0010 | e310 | 0018 | 3d0c | 56f8 | 4af8 | 0000 | 0113 | 6d50 | 37dc | 4240 | 0000 | 0000 | 53ff | 242c | 0000 | 0010 | dfb4 | 2954 | 0038 | 0002 | 438a |
| 2127100 | 2520 | 46ec | 56f8 | 4af8 | 0000 | 536f | 6750 | 3318 | 3280 | 247c | 0011 | 142c | 0018 | 3d0c | 56f8 | 4af8 | 0000 | 0ddf | 6d50 | 3cf4 | 242c | 0000 | 0011 | 5e7c |
| 2127160 | 0010 | 9788 | 0000 | 0038 | b27c | b66c | 0000 | 081e | 0000 | 0914 | 000f | fd5c | 0200 | 0db5 | 0500 | 1cdd | 0000 | 58ef | 0000 | 0013 | 0000 | 3287 | 0089 | 5623 |
| 2127240 | 0000 | 031b | 0000 | 315f | 2c78 | 004c | 0002 | 438a | 5d10 | 0000 | 0200 | 54ef | 671c | 682c | 4754 | 5758 | 4b8c | 0000 | 0000 | 0113 | 6750 | 3050 | 33d8 | 247c |
| 2127320 | 0010 | e79c | 0018 | 3d0c | 56f8 | 4af8 | 0000 | 0113 | 6d50 | 37dc | 4240 | 0000 | 0000 | 53ff | 242c | 0000 | 0010 | dfb4 | 0010 | 98a0 | 0000 | 00a8 | b27c | b66c |
| 2127400 | 0000 | 080e | 0000 | 0904 | 0010 | 35b0 | 0200 | 0db5 | 0500 | 1cdd | 0000 | 5a8f | 0000 | 0013 | 0000 | 3287 | 0089 | df03 | 0000 | 031b | 0000 | 315f | 0010 | 97f8 |

```
2127460 0000 0038 b27c b66c 0000 080d 0000 0903 0010 978c 0200 0db5 0500 1cdd 0000 5a87 0000 0013 0000 3287 0089 dc03 0000 031b
2127540 0000 315f 0010 98a0 0000 0038 b27c b66c 0000 0800 0000 08f6 0010 6ebc 0200 0db5 0500 1cdd 0000 5767 0000 0013 0000 3287
2127620 0088 f583 0000 031b 0000 315f 27f0 003c 0010 9868 56f8 6869 69b0 4768 33bc 3aa0 0010 d580 001c 4550 4b8c 0000 0000 0113
2127700 5370 37b0 8d94 aab4 0000 a260 386c 3d30 2420 0000 0010 e8ec 2954 0034 0002 438a 56f8 4af8 0000 0857 55f0 4af8 0000 0857
2127760 671c 5758 4b8c 0000 0000 0113 55f0 4af8 0000 0113 6750 22bc 0010 e8ec 0010 9948 0000 0038 b27c b66c 0000 07ff 0000 08f5
2130040 0010 97fc 0200 0db5 0500 1cdd 0000 5a07 0000 0013 0000 3287 0089 b1c3 0000 031b 0000 315f 27f0 003c 0010 9910 56f8 6868
2130120 69b0 4768 33bc 3aa0 0010 d580 001c 4550 4b8c 0000 0000 0113 5370 37b0 8d94 aab4 0000 a260 386c 3d30 2420 0000 0010 e8ec
2130200 28c4 0034 0010 e98c 56f8 4af8 0000 0857 55f0 4af8 0000 0857 671c 5758 4b8c 0000 0000 0113 55f0 4af8 0000 0113 6750 22bc
2130260 0010 e8ec 0010 9b3c 0000 0188 b27c b66c 0000 07fe 0000 08f4 0010 98a4 0200 0db5 0500 1cdd 0000 5a0f 0000 0013 0000 3287
2130340 0089 b2c3 0000 031b 0000 315f 0010 99b8 0000 0038 b27c b66c 0000 07fd 0000 08f3 0010 994c 0200 0db5 0500 1cdd 0000 59ff
2130420 0000 0013 0000 3287 0089 b043 0000 031b 0000 315f 0010 99f0 0000 0038 b27c b66c 0000 07fc 0000 08f2 0010 9984 0200 0db5
2130500 0500 1cdd 0000 562f 0000 0013 0000 3287 0088 ac43 0000 031b 0000 315f 0010 9a28 0000 0038 b27c b66c 0000 07fb 0000 08f1
2130560 0010 99bc 0200 0db5 0500 1cdd 0000 59f7 0000 0013 0000 3287 0089 ac03 0000 031b 0000 315f 0010 9a60 0000 0038 b27c b66c
2130640 0000 07f8 0000 08ee 0010 9528 0200 0db5 0500 1cdd 0000 57f7 0000 0013 0000 3287 0089 1403 0000 031b 0000 315f 0010 9a98
2130720 0000 0038 b27c b66c 0000 07f7 0000 08ed 0010 9a2c 0200 0db5 0500 1cdd 0000 59df 0000 001b 0000 3287 0089 a183 0000 031b
2131000 0000 315f 0010 9b3c 0000 0038 b27c b66c 0000 07f6 0000 08ec 0010 9a64 0200 0db5 0500 1cdd 0000 59d7 0000 0013 0000 3287
2131060 0089 9e83 0000 031b 0000 315f 2c78 0040 0002 438a 45c4 3050 4300 0000 0000 55a7 0008 ec1c 0014 4550 6d50 5370 3280 247c
2131140 0008 cefc 0010 4064 0008 ec1c 000c 4144 0000 55af 242c 0000 0008 ec1c 0026 496c 6c65 6761 6c20 6465 6369 6d61 6c20 6c69
2131220 7465 7261 6c20 666f 756e 6420 696e 206c 696e 6520 000f 48e4 0010 9cf8 0000 0038 b27c b66c 0000 07f5 0000 08eb 0010 9a9c
2131300 0200 0db5 0500 1cdd 0000 59c7 0000 001b 0000 3287 0089 9a63 0000 031b 0000 315f 2c78 004a 0002 438a 45b8 4700 4754 2ba0
2131360 0018 001c 379c 56f8 4b8c 0000 0000 5397 6d50 3774 4e1c 0000 0000 5397 723c 2c58 379c 56f8 4b8c 0000 0000 5297 6d50 3774
2131440 4e1c 0000 0000 5297 723c 8919 2954 002c 0002 438a 2520 46d8 332c 247c 0011 2728 0014 3d00 56f8 4af8 0000 0abf 671c 37dc
2131520 242c 0000 0011 3528 0011 b694 000a d614 2c78 0104 0002 438a 2520 46d8 3410 0034 35c8 32b8 24d0 0000 0011 23f8 0038 3df4
2131600 0034 56f8 4b8c 0000 0000 0daf 55f0 4af8 0000 5257 6af0 0030 2ba0 0034 0012 37c4 0030 31d4 0028 4a7c 0028 2c88 0036 2c58
2131660 37c4 0030 56f8 4af8 0000 0a0f 6750 3410 002c 31f0 2410 0000 0011 142c 0030 3df4 002c 56f8 4b8c 0000 0000 0a7f 6af0 0028
2131740 bfcc 3380 0024 3c9c 0000 0028 0011 2360 0028 3380 0020 411c 0000 0024 0011 22dc 0024 3df4 0020 56f8 4b8c 0000 0000 524f
2132020 671c 3380 001c 247c 0011 2484 0020 31f4 001c 56f8 4b8c 0000 0000 52af 55f0 4af8 0000 5257 6aa0 2ba0 001c 000e 37b0 318c
2132100 4a7c 0010 2c88 0010 2c58 33bc 3918 409c 0011 23f8 0014 3d00 56f8 4af8 0000 0ddf 6d0c 723c 0010 9dcc 0000 0070 b27c b66c
2132160 0000 07d1 0000 08c7 0010 9d34 0200 0db5 0500 1cdd 0000 5837 0000 0013 0000 3287 0089 2423 0000 031b 0000 315f 0010 9dcc
2132240 0000 0038 b27c b66c 0000 07d2 0000 08c8 0010 9dd0 0200 0db5 0500 1cdd 0000 583f 0000 0013 0000 3287 0089 2963 0000 031b
2132320 0000 315f 2c78 0064 0002 438a 2520 46d8 56f8 4af8 0000 5277 6750 33f4 31f0 247c 0011 142c 001c 3d18 56f8 4af8 0000 25d7
2132400 671c 3348 24d0 0000 0011 255c 0018 332c 40f4 0000 0011 257c 0014 3d00 56f8 4af8 0000 52af 55f0 4af8 0000 5277 55f0 4af8
2132460 0000 0ddf 6d0c 723c 0010 9e60 0000 0038 b27c b66c 0000 07d3 0000 08c9 0010 9e64 0200 0db5 0500 1cdd 0000 5847 0000 0013
2132540 0000 3287 0089 2ae3 0000 031b 0000 315f 2c78 005c 0002 438a 2520 46ec 56f8 4af8 0000 53c7 671c 3348 24d0 0000 0011 25c8
2132620 0018 2ba0 0018 001c 379c 56f8 4b8c 0000 0000 0df7 55f0 4af8 0000 0e27 69b0 2c88 0014 2c58 3d0c 56f8 4b8c 0000 0000 54af
2132700 69b0 bfcc 2410 0000 0011 25e8 0010 9f00 0000 0070 b27c b66c 0000 07d4 0000 08ca 0010 9e9c 0200 0db5 0500 1cdd 0000 584f
2132760 0000 0013 0000 3287 0089 2be3 0000 031b 0000 315f 0010 9f00 0000 0038 b27c b66c 0000 07d5 0000 08cb 0010 9f04 0200 0db5
2133040 0500 1cdd 0000 5867 0000 0013 0000 3287 0089 3303 0000 031b 0000 315f 2c78 0030 0002 438a 2520 46d8 56f8 4af8 0000 09ff
2133120 671c 332c 24d0 0000 0011 2690 0014 3d00 56f8 4af8 0000 09ff 6d0c 723c 0010 9f88 0000 0038 b27c b66c 0000 07d6 0000 08cc
2133200 0010 9f8c 0200 0db5 0500 1cdd 0000 5877 0000 0013 0000 3287 0089 36c3 0000 031b 0000 315f 2c78 0050 0002 438a 45c4 46d8
2133260 2ba0 0014 0010 3844 37f0 31f0 242c 0000 0011 2708 2c30 000e 37dc 3788 242c 0000 0011 2728 2c30 000e 3844 37f0 31f0 234c
2133340 0011 1754 2c58 3788 56f8 4af8 0000 531f 6d0c 723c 0010 9fec 0000 0038 b27c b66c 0000 07d7 0000 08cd 0010 9ff0 0200 0db5
2133420 0500 1cdd 0000 5857 0000 0013 0000 3287 0089 2e43 0000 031b 0000 315f 2954 002c 0002 438a 2520 46d8 332c 247c 0011 26d8
2133500 0014 3d00 56f8 4af8 0000 3407 671c 371c 242c 0000 0011 25c8 0010 a0c0 0000 0038 b27c b66c 0000 07d8 0000 08ce 0010 a0c4
2133560 0200 0db5 0500 1cdd 0000 588f 0000 0013 0000 3287 0089 3d03 0000 031b 0000 315f 2c78 009c 0002 438a 2520 46d8 56f8 4af8
2133640 0000 52bf 671c 3380 001c 247c 0011 27d0 0020 2ba0 0020 0010 37c4 001c 31a4 4a7c 0014 2c88 002c 2c58 3df4 001c 56f8 4af8
2133720 0000 53bf 671c 3364 24d0 0000 0011 1e90 001c 3118 56f8 4af8 0000 0ddf 6a50 bfcc 2ba0 0018 000e 379c 318c 4a7c 0010 2c88
2134000 000e 2c58 332c 3a4c 0011 1fc8 0014 3d00 56f8 4af8 0000 52af 55f0 4af8 0000 52bf 55f0 4af8 0000 0ddf 6d0c 723c 0010 a184
2134060 0000 0038 b27c b66c 0000 07d9 0000 08cf 0010 a188 0200 0db5 0500 1cdd 0000 57e7 0000 0013 0000 3287 0089 1203 0000 031b
2134140 0000 315f 2c78 008c 0002 438a 2520 46d8 56f8 4af8 0000 527f 6750 33f4 31f0 247c 0011 15dc 001c 2ba0 001c 000e 37b0 31a4
2134220 4a7c 0014 2c88 001c 2c58 3468 3d78 41e8 0000 1f8f 4300 0000 0000 2397 0011 2800 0018 2ba0 0018 000e 379c 318c 4a7c 0010
2134300 2c88 0010 2c58 332c 40f4 0000 0011 23b0 0014 3d00 56f8 4af8 0000 52af 55f0 4af8 0000 527f 55f0 4af8 0000 0ddf 6d0c 723c
2134360 0010 a1ec 0000 0038 b27c b66c 0000 07da 0000 08d0 0010 a1f0 0200 0db5 0500 1cdd 0000 589f 0000 0013 0000 3287 0089 4223
2134440 0000 031b 0000 315f 2c78 0030 0002 438a 2520 46d8 33bc 35c8 31f0 247c 0011 23f8 0014 3d00 56f8 4af8 0000 0daf 6750 3844
2134520 31f0 234c 0011 144c 0010 a460 0000 0038 b27c b66c 0000 07db 0000 08d1 0010 a464 0200 0db5 0500 1cdd 0000 58a7 0000 0013
```

| | | | | | | | | | | | | | | | | | | | | | | | | |
|---|---|---|---|---|---|---|---|---|---|---|---|---|---|---|---|---|---|---|---|---|---|---|---|---|
| 2134600 | 0000 | 3287 | 0089 | 4563 | 0000 | 031b | 0000 | 315f | 2c78 | 023c | 0002 | 438a | 45b8 | 46ec | 2ba0 | 0014 | 0110 | 37f0 | 3b4c | 0000 | 0011 | 18c4 | 0014 | 4538 |
| 2134660 | 4b8c | 0000 | 0000 | 0373 | 5370 | 4550 | 4b8c | 0000 | 0000 | 037b | 6b74 | 4538 | 4b8c | 0000 | 0000 | 034b | 6bb4 | 4550 | 4b8c | 0000 | 0000 | 03a3 | 6b74 | 4538 |
| 2134740 | 4b8c | 0000 | 0000 | 034b | 6bb4 | 4550 | 4b8c | 0000 | 0000 | 0373 | 6b74 | 4538 | 4b8c | 0000 | 0000 | 034b | 6bb4 | 4550 | 4b8c | 0000 | 0000 | 0333 | 6b74 | 4538 |
| 2135020 | 4b8c | 0000 | 0000 | 032b | 6bb4 | 4550 | 4b8c | 0000 | 0000 | 0323 | 6b74 | 4538 | 4b8c | 0000 | 0000 | 02fb | 6bb4 | 4550 | 4b8c | 0000 | 0000 | 032b | 6b74 | 4538 |
| 2135100 | 4b8c | 0000 | 0000 | 0383 | 6bb4 | 4550 | 4b8c | 0000 | 0000 | 03cb | 6b74 | 4538 | 4b8c | 0000 | 0000 | 03a3 | 6bb4 | 4550 | 4b8c | 0000 | 0000 | 02fb | 6b74 | 4538 |
| 2135160 | 4b8c | 0000 | 0000 | 03cb | 6bb4 | 4550 | 4b8c | 0000 | 0000 | 030b | 6b74 | 4538 | 4b8c | 0000 | 0000 | 0393 | 6bb4 | 4550 | 4b8c | 0000 | 0000 | 0393 | 6b74 | 4538 |
| 2135240 | 4b8c | 0000 | 0000 | 030b | 6bb4 | 234c | 0011 | 19bc | 2c58 | 37f0 | 3b4c | 0000 | 0011 | 28dc | 000c | 4550 | 4b8c | 0000 | 0000 | 0373 | 5370 | 4538 | 4b8c | 0000 |
| 2135320 | 0000 | 037b | 6bb4 | 4550 | 4b8c | 0000 | 0000 | 034b | 6b74 | 4538 | 4b8c | 0000 | 0000 | 03a3 | 6bb4 | 4550 | 4b8c | 0000 | 0000 | 034b | 6b74 | 4538 | 4b8c | 0000 |
| 2135400 | 0000 | 0373 | 6bb4 | 4550 | 4b8c | 0000 | 0000 | 034b | 6b74 | 4538 | 4b8c | 0000 | 0000 | 0333 | 6bb4 | 4550 | 4b8c | 0000 | 0000 | 032b | 6b74 | 4538 | 4b8c | 0000 |
| 2135460 | 0000 | 0323 | 6bb4 | 4550 | 4b8c | 0000 | 0000 | 02fb | 6b74 | 4538 | 4b8c | 0000 | 0000 | 032b | 6bb4 | 4550 | 4b8c | 0000 | 0000 | 0383 | 6b74 | 4538 | 4b8c | 0000 |
| 2135540 | 0000 | 03cb | 6bb4 | 4550 | 4b8c | 0000 | 0000 | 03a3 | 6b74 | 4538 | 4b8c | 0000 | 0000 | 02fb | 6bb4 | 4550 | 4b8c | 0000 | 0000 | 0323 | 6b74 | 4538 | 4b8c | 0000 |
| 2135620 | 0000 | 0393 | 6bb4 | 4550 | 4b8c | 0000 | 0000 | 037b | 6b74 | 4538 | 4b8c | 0000 | 0000 | 031b | 6bb4 | 4550 | 4b8c | 0000 | 0000 | 032b | 6b74 | 4538 | 4b8c | 0000 |
| 2135700 | 0000 | 0393 | 6bb4 | 234c | 0011 | 19bc | 0010 | b3c4 | 0000 | 0338 | b27c | b66c | 0000 | 07dc | 0003 | 08d2 | 0010 | 4a5c | 0200 | 0db5 | 0500 | 1cdd | 0000 | 58b7 |
| 2135760 | 0000 | 0013 | 0000 | 3287 | 0089 | 4903 | 0000 | 031b | 0000 | 315f | 0008 | cd4c | 0200 | 58bf | 0000 | 3287 | 0000 | 0008 | 0010 | 4a8c | 0010 | 4a8c | 0001 | 0063 |
| 2136040 | 0000 | 0000 | 0000 | 3ecf | b328 | 9880 | 000a | 2998 | 0000 | 0000 | 0000 | 3f7f | b464 | 34ac | 000a | 29cc | 000e | 8360 | 0020 | 2240 | 2823 | 2938 | 392f | 3038 |
| 2136120 | 2f32 | 3920 | 7072 | 6f6d | 7074 | 2e70 | 6c20 | 2020 | 2031 | 332e | 3122 | 0000 | 0010 | 185c | 0100 | 2def | 0000 | 2c0f | 0000 | 0004 | 0010 | a560 | 0010 | a560 |
| 2136200 | 0001 | 0060 | 0000 | 0000 | 000b | 7265 | 6164 | 5f73 | 696d | 706c | 6500 | a63c | 0000 | 0028 | 0010 | 1884 | b27c | b66c | 0000 | 06f3 | 7fff | ffff | 0010 | a720 |
| 2136260 | 0200 | 0db5 | 0100 | 32b5 | 0000 | 2c0f | 0000 | 315f | 0000 | 2c0f | b328 | 009f | 0010 | a534 | 0000 | 0000 | 2cac | a528 | 0002 | 438a | 2ca0 | 34ac | 0000 | 0000 |
| 2136340 | 0000 | 0001 | 000b | b4dc | 000b | b4dc | 0002 | 438a | 000a | 28b8 | 2c78 | 000a | 0002 | 438a | c5a8 | 8664 | 0013 | 33ec | 0008 | e88c | 0100 | 516f | 0000 | 2c0f |
| 2136420 | 0000 | 0004 | 0010 | a5e8 | 0010 | a62c | 0001 | 0060 | 0000 | 0000 | 000b | 7265 | 6164 | 5f71 | 756f | 7465 | 6400 | 0000 | 27f0 | 0010 | 0010 | c254 | 239c | 0000 |
| 2136500 | 0011 | 1cbc | 2938 | 0012 | 0010 | a60c | 4e1c | 0000 | 0000 | 0007 | 2edc | 9ce1 | 27f0 | 2ff1 | 0010 | a62c | 2ca0 | 26f8 | 0000 | 0004 | 0000 | 0002 | 0010 | a5d4 |
| 2136560 | 0010 | a62c | 0010 | a616 | 0010 | 182c | 28c4 | 0020 | 0010 | 32f8 | 56f8 | 671c | 682c | 3050 | 24d0 | 0000 | 0010 | a5a4 | 0010 | 2340 | 0010 | a5a4 | 2954 | 0010 |
| 2136640 | 0002 | 438a | 239c | 0000 | 0008 | ec1c | 000d | 7265 | 6164 | 2063 | 6f6e | 7374 | 616e | 7400 | 0000 | 2c0f | b328 | a618 | 0010 | 6408 | 0000 | 0000 | 0010 | a4f8 |
| 2136720 | 0100 | 2def | 0000 | 510f | 0000 | 0004 | 0010 | a754 | 0010 | a754 | 0001 | 005f | 0000 | 0000 | 2c78 | 0028 | 0002 | 438a | 2520 | 46d8 | 24d0 | 0000 | 0010 | 841c |
| 2137000 | 0010 | 37dc | 4240 | 0000 | 0000 | 3287 | 242c | 0000 | 000c | 889c | 2c78 | 0028 | 0002 | 438a | 2520 | 46d8 | 4754 | 247c | 0010 | 841c | 0014 | 3858 | 37dc | 41d4 |
| 2137060 | 0000 | 3287 | 242c | 0000 | 000c | 88dc | 000e | 736b | 6970 | 2063 | 6f6e | 7374 | 616e | 7473 | 00ff | ffff | 0011 | 736b | 6970 | 5f72 | 6573 | 745f | 6f66 | 5f6c |
| 2137140 | 696e | 6500 | 0020 | 2240 | 2823 | 2938 | 382f | 3131 | 2f30 | 3120 | 7265 | 6164 | 636f | 6e73 | 742e | 706c | 0932 | 372e | 3222 | 0000 | 0000 | 0028 | 0010 | a530 |
| 2137220 | b27c | b66c | 0000 | 0705 | 7fff | ffff | 0013 | 33c0 | 0200 | 0db5 | 0100 | 32b5 | 0000 | 510f | 0000 | 315f | 2c78 | 0012 | 0002 | 438a | 4e1c | 0000 | 0000 | 51c7 |
| 2137300 | 228c | 34ac | 2cac | 475c | 0002 | 438a | 2ca0 | 1b9c | 0000 | 0000 | 0000 | 0001 | 0010 | a740 | 0010 | a740 | 0002 | 438a | 0010 | 423c | 0008 | e92c | 0200 | 5197 |
| 2137360 | 0000 | 510f | 0000 | 0008 | 0010 | 67f8 | 0010 | 67f8 | 0001 | 005f | 0000 | 0000 | 0008 | e9cc | 0100 | 51bf | 0000 | 510f | 0000 | 0004 | 0010 | 6dd4 | 0010 | 6dd4 |
| 2137440 | 0001 | 005f | 0000 | 0000 | 000a | 7365 | 7061 | 7261 | 746f | 7273 | 0000 | 0000 | 0000 | 5207 | b328 | a584 | 0010 | 84b8 | 0000 | 0000 | 000c | 058c | 0400 | 518f |
| 2137520 | 0000 | 510f | 0000 | 0010 | 0010 | a8b8 | 0010 | a8b8 | 0001 | 005f | 0000 | 0000 | 2954 | 0024 | 0002 | 438a | 36a4 | 4408 | 0200 | 511f | 6b48 | 6c08 | 4254 | 0000 |
| 2137600 | 0000 | 0013 | 359c | 22bc | 0008 | ce9c | b464 | 3f78 | 0014 | 1748 | 0015 | 3f74 | 0013 | 34d4 | 2954 | 0020 | 0002 | 438a | 44c4 | 0000 | 0100 | 5127 | 6b48 | 41e8 |
| 2137660 | 0000 | 000b | 239c | 0000 | 0008 | ce9c | 2954 | 0024 | 0002 | 438a | 36a4 | 4408 | 0200 | 5127 | 6b48 | 6c08 | 4254 | 0000 | 0000 | 0013 | 359c | 22bc | 0008 | ce9c |
| 2137740 | 0000 | 5207 | b328 | a840 | 0010 | 44e4 | 0000 | 0000 | 0008 | e98c | 0100 | 51af | 0000 | 510f | 0000 | 0004 | 0010 | aa20 | 0010 | aa48 | 0001 | 005f | 0000 | 0000 |
| 2140020 | 27f0 | 0016 | 0010 | 66e8 | 4e1c | 0000 | 0000 | 0007 | 54a8 | 49c8 | 228c | 0000 | 2cac | 4736 | 0002 | 438a | 2ca0 | 30bd | 0000 | 0000 | 0000 | 0001 | 0010 | a8a0 |
| 2140100 | 0010 | 66e8 | 0010 | 66f2 | 000a | 28ec | 2c78 | 001e | 0002 | 438a | 45b8 | 320c | 329c | 247c | 0010 | a788 | 0014 | 3d00 | 4a7c | 000c | 723c | 4730 | 000a | 696e |
| 2140160 | 6974 | 5f63 | 6f75 | 6e74 | 0000 | 0000 | 0008 | e9ac | 0100 | 51b7 | 0000 | 510f | 0000 | 0004 | 0010 | 6d70 | 0010 | 6d70 | 0001 | 005f | 0000 | 0000 | 0008 | e96c |
| 2140240 | 0400 | 51a7 | 0000 | 510f | 0000 | 0010 | 0010 | 6a58 | 0010 | 6ad4 | 0001 | 005f | 0000 | 0000 | 0008 | e94c | 0300 | 519f | 0000 | 510f | 0000 | 000c | 0010 | 692c |
| 2140320 | 0010 | 692c | 0001 | 005f | 0000 | 0000 | 000a | 6469 | 7363 | 6f6e | 6e65 | 6374 | 0000 | 0000 | 000d | 636f | 6e66 | 6967 | 7572 | 6174 | 696f | 6e00 | 0000 | 51f7 |
| 2140400 | b328 | 0000 | 0010 | 441c | 0000 | 0000 | 27f0 | 001c | 0010 | a9b8 | 9294 | 9a90 | a858 | aab4 | 0000 | a3ec | 3050 | 22bc | 0010 | a890 | 2954 | 0020 | 0002 | 438a |
| 2140460 | 44c4 | 0000 | 0100 | 5137 | 6b48 | 41e8 | 0000 | 000b | 239c | 0000 | 0008 | ce1c | 2954 | 0024 | 0002 | 438a | 36a4 | 4408 | 0200 | 5137 | 6b48 | 6c08 | 4254 | 0000 |
| 2140540 | 0000 | 0013 | 359c | 22bc | 0008 | ce1c | 000c | 6172 | 6368 | 6974 | 6563 | 7475 | 7265 | 006d | 2938 | 0012 | 0010 | aa48 | 4e1c | 0000 | 0000 | 0003 | 2edc | 4714 |
| 2140620 | 27f0 | 34ac | 0010 | aa48 | 2ca0 | a9e0 | 0000 | 0000 | 0000 | 0001 | 0010 | aa0c | 0010 | aa48 | 0002 | 438a | 0010 | aa44 | 0010 | aa18 | 2954 | 0028 | 0002 | 438a |
| 2140700 | 2520 | a858 | aab4 | 0000 | a484 | a858 | aaf0 | ffff | ad64 | 247c | 0010 | 6334 | 0010 | 2340 | 0010 | a890 | 000b | 7265 | 7365 | 7276 | 6564 | 2e70 | 6c00 | 0000 |
| 2140760 | 0000 | 51f7 | b328 | 46fc | 0010 | 43f0 | 0000 | 0000 | 000c | 7265 | 6164 | 636f | 6e73 | 742e | 706c | 0000 | 28c4 | 0012 | 0010 | aab4 | 4e1c | 0000 | 0000 | 521f |
| 2141040 | 228c | 0000 | 28c4 | 0012 | 0010 | acf0 | 4e1c | 0000 | 0000 | 1cbf | 228c | aaa0 | 0010 | d5c0 | 0010 | 40fc | 0200 | 5117 | 0000 | 3287 | 0000 | 0008 | 0010 | aaec |
| 2141120 | 0010 | aaec | 0041 | 0000 | 0000 | 0000 | 2c78 | 0010 | 0002 | 438a | 239c | 0000 | 0010 | 410c | 0010 | 6274 | 0200 | 511f | 0000 | 3287 | 0000 | 0008 | 0010 | ab1c |
| 2141200 | 0010 | ab1c | 0041 | 0000 | 0000 | 0000 | 2c78 | 0010 | 0002 | 438a | 239c | 0000 | 0010 | 6284 | 0010 | 62c4 | 0100 | 510f | 0000 | 3287 | 0000 | 0004 | 0010 | ab4c |
| 2141260 | 0010 | ab4c | 0041 | 0000 | 0000 | 0000 | 2c78 | 0010 | 0002 | 438a | 239c | 0000 | 0010 | 62a4 | 0010 | ab2c | 0200 | 510f | 0000 | 3287 | 0000 | 0008 | 0010 | ab7c |
| 2141340 | 0010 | ab7c | 0041 | 0000 | 0000 | 0000 | 2c78 | 0010 | 0002 | 438a | 239c | 0000 | 0010 | 62d4 | 0010 | 6304 | 0100 | 5127 | 0000 | 3287 | 0000 | 0004 | 0010 | abac |
| 2141420 | 0010 | abac | 0041 | 0000 | 0000 | 0000 | 2c78 | 0010 | 0002 | 438a | 239c | 0000 | 0010 | 62f4 | 0010 | ab8c | 0200 | 5127 | 0000 | 3287 | 0000 | 0008 | 0010 | abdc |
| 2141500 | 0010 | abdc | 0041 | 0000 | 0000 | 0000 | 2c78 | 0010 | 0002 | 438a | 239c | 0000 | 0010 | 6314 | 0010 | 6344 | 0000 | 512f | 0000 | 3287 | 0000 | 0000 | 0010 | ac0c |
| 2141560 | 0010 | ac0c | 0041 | 0000 | 0000 | 0000 | 2c78 | 0010 | 0002 | 438a | 239c | 0000 | 0010 | 6334 | 0010 | abec | 0100 | 512f | 0000 | 3287 | 0000 | 0004 | 0010 | ac3c |
| 2141640 | 0010 | ac3c | 0041 | 0000 | 0000 | 0000 | 2c78 | 0010 | 0002 | 438a | 239c | 0000 | 0010 | 6354 | 0010 | 6384 | 0100 | 5137 | 0000 | 3287 | 0000 | 0004 | 0010 | ac6c |

| | | | | | | | | | | | | | | | | | | | | | | | | |
|---|---|---|---|---|---|---|---|---|---|---|---|---|---|---|---|---|---|---|---|---|---|---|---|---|
| 2141720 | 0010 | ac6c | 0041 | 0000 | 0000 | 0000 | 2c78 | 0010 | 0002 | 438a | 239c | 0000 | 0010 | 6374 | 0010 | ac4c | 0200 | 5137 | 0000 | 3287 | 0000 | 0008 | 0010 | ac9c |
| 2142000 | 0010 | ac9c | 0041 | 0000 | 0000 | 0000 | 2c78 | 0010 | 0002 | 438a | 239c | 0000 | 0010 | 6394 | ffff | ffff | 0100 | 51d7 | 0000 | 3287 | 0000 | 0004 | 0010 | accc |
| 2142060 | 0010 | accc | 0001 | 0061 | 0000 | 0000 | 2cac | 0007 | 0002 | 438a | 2ca0 | 009f | 0000 | 01fc | 0000 | 0051 | 0010 | 1f38 | 0010 | b314 | 0002 | 438a | 0010 | 46a0 |
| 2142140 | 28c4 | 0012 | 0010 | a404 | 4e1c | 0000 | 0000 | 5227 | 228c | 3480 | 28c4 | 0012 | 0010 | ad38 | 4e1c | 0000 | 0000 | 1ccf | 228c | 0000 | ffff | ffff | 0300 | 53ef |
| 2142220 | 0000 | 3287 | 0000 | 000c | 0010 | d35c | 0010 | d35c | 0001 | 0062 | 0000 | 0000 | 28c4 | 0012 | 0010 | ad4c | 4e1c | 0000 | 0000 | 522f | 228c | acf8 | 28c4 | 0012 |
| 2142300 | 0010 | ad60 | 4e1c | 0000 | 0000 | 5237 | 228c | 46a4 | 28c4 | 0012 | 0010 | ad74 | 4e1c | 0000 | 0000 | 523f | 228c | 26f8 | 28c4 | 0012 | 0010 | ad88 | 4e1c | 0000 |
| 2142360 | 0000 | 1d6f | 228c | 2020 | 28c4 | 0012 | 0010 | ad9c | 4e1c | 0000 | 0000 | 5247 | 228c | ad50 | 28c4 | 0012 | 0010 | adb0 | 4e1c | 0000 | 0000 | 524f | 228c | ad60 |
| 2142440 | 28c4 | 0012 | 0010 | adc4 | 4e1c | 0000 | 0000 | 5257 | 228c | 322d | 28c4 | 0012 | 0010 | add8 | 4e1c | 0000 | 0000 | 525f | 228c | 2020 | 28c4 | 0012 | 0010 | adec |
| 2142520 | 4e1c | 0000 | 0000 | 5267 | 228c | ada0 | 28c4 | 0012 | 0010 | ae00 | 4e1c | 0000 | 0000 | 526f | 228c | adb0 | 28c4 | 0012 | 0010 | ae14 | 4e1c | 0000 | 0000 | 5277 |
| 2142600 | 228c | 3241 | 28c4 | 0012 | 0010 | ae28 | 4e1c | 0000 | 0000 | 527f | 228c | 2020 | 28c4 | 0012 | 0010 | ae3c | 4e1c | 0000 | 0000 | 5287 | 228c | adf0 | 28c4 | 0012 |
| 2142660 | 0010 | ae50 | 4e1c | 0000 | 0000 | 1ff7 | 228c | ae00 | 28c4 | 0012 | 0010 | ae64 | 4e1c | 0000 | 0000 | 528f | 228c | 467c | 28c4 | 0012 | 0010 | ae78 | 4e1c | 0000 |
| 2142740 | 0000 | 5297 | 228c | 2020 | 28c4 | 0012 | 0010 | ae8c | 4e1c | 0000 | 0000 | 529f | 228c | ae38 | 28c4 | 0012 | 0010 | aea0 | 4e1c | 0000 | 0000 | 52a7 | 228c | 467c |
| 2143020 | 28c4 | 0012 | 0010 | aeb4 | 4e1c | 0000 | 0000 | 52af | 228c | 26f8 | 28c4 | 0012 | 0010 | aec8 | 4e1c | 0000 | 0000 | 52b7 | 228c | 2020 | 28c4 | 0012 | 0010 | aedc |
| 2143100 | 4e1c | 0000 | 0000 | 21af | 228c | ae90 | 28c4 | 0012 | 0010 | aef0 | 4e1c | 0000 | 0000 | 2247 | 228c | aea0 | 28c4 | 0012 | 0010 | af04 | 4e1c | 0000 | 0000 | 52bf |
| 2143160 | 228c | 3289 | 28c4 | 0012 | 0010 | af18 | 4e1c | 0000 | 0000 | 52c7 | 228c | 2020 | 28c4 | 0012 | 0010 | af2c | 4e1c | 0000 | 0000 | 52cf | 228c | aee0 | 28c4 | 0012 |
| 2143240 | 0010 | af40 | 4e1c | 0000 | 0000 | 2397 | 228c | aef0 | 28c4 | 0012 | 0010 | af54 | 4e1c | 0000 | 0000 | 52d7 | 228c | 329d | 28c4 | 0012 | 0010 | af68 | 4e1c | 0000 |
| 2143320 | 0000 | 2477 | 228c | 2020 | 28c4 | 0012 | 0010 | af7c | 4e1c | 0000 | 0000 | 24c7 | 228c | af30 | 28c4 | 0012 | 0010 | af90 | 4e1c | 0000 | 0000 | 52df | 228c | af40 |
| 2143400 | 28c4 | 0012 | 0010 | afa4 | 4e1c | 0000 | 0000 | 25d7 | 228c | 4654 | 28c4 | 0012 | 0010 | afb8 | 4e1c | 0000 | 0000 | 2627 | 228c | 2020 | 28c4 | 0012 | 0010 | afcc |
| 2143460 | 4e1c | 0000 | 0000 | 2677 | 228c | af78 | 28c4 | 0012 | 0010 | afe0 | 4e1c | 0000 | 0000 | 52e7 | 228c | 4654 | 28c4 | 0012 | 0010 | aff4 | 4e1c | 0000 | 0000 | 52ef |
| 2143540 | 228c | 26f8 | 28c4 | 0012 | 0010 | b008 | 4e1c | 0000 | 0000 | 500f | 228c | 2020 | 28c4 | 0012 | 0010 | b01c | 4e1c | 0000 | 0000 | 280f | 228c | afd0 | 28c4 | 0012 |
| 2143620 | 0010 | b030 | 4e1c | 0000 | 0000 | 52f7 | 228c | afe0 | 28c4 | 0012 | 0010 | b044 | 4e1c | 0000 | 0000 | 294f | 228c | 32e5 | 28c4 | 0012 | 0010 | b058 | 4e1c | 0000 |
| 2143700 | 0000 | 297f | 228c | 2020 | 28c4 | 0012 | 0010 | b06c | 4e1c | 0000 | 0000 | 52ff | 228c | b020 | 28c4 | 0012 | 0010 | b080 | 4e1c | 0000 | 0000 | 2a37 | 228c | b030 |
| 2143760 | 28c4 | 0012 | 0010 | b094 | 4e1c | 0000 | 0000 | 5307 | 228c | 32f9 | 28c4 | 0012 | 0010 | b0a8 | 4e1c | 0000 | 0000 | 530f | 228c | 2020 | 28c4 | 0012 | 0010 | b0bc |
| 2144040 | 4e1c | 0000 | 0000 | 2aa7 | 228c | b070 | 28c4 | 0012 | 0010 | b0d0 | 4e1c | 0000 | 0000 | 2ae7 | 228c | b080 | 28c4 | 0012 | 0010 | b0e4 | 4e1c | 0000 | 0000 | 5317 |
| 2144120 | 228c | 462c | 28c4 | 0012 | 0010 | b0f8 | 4e1c | 0000 | 0000 | 531f | 228c | 2020 | 28c4 | 0012 | 0010 | b10c | 4e1c | 0000 | 0000 | 5327 | 228c | b0b8 | 28c4 | 0012 |
| 2144200 | 0010 | b120 | 4e1c | 0000 | 0000 | 532f | 228c | 462c | 28c4 | 0012 | 0010 | b134 | 4e1c | 0000 | 0000 | 5337 | 228c | 26f8 | 28c4 | 0012 | 0010 | b148 | 4e1c | 0000 |
| 2144260 | 0000 | 533f | 228c | 2020 | 28c4 | 0012 | 0010 | b15c | 4e1c | 0000 | 0000 | 5347 | 228c | b110 | 28c4 | 0012 | 0010 | b170 | 4e1c | 0000 | 0000 | 3f5f | 228c | b120 |
| 2144340 | 28c4 | 0012 | 0010 | b184 | 4e1c | 0000 | 0000 | 534f | 228c | 3341 | 28c4 | 0012 | 0010 | b198 | 4e1c | 0000 | 0000 | 5357 | 228c | 2020 | 28c4 | 0012 | 0010 | b1ac |
| 2144420 | 4e1c | 0000 | 0000 | 535f | 228c | b160 | 28c4 | 0012 | 0010 | b1c0 | 4e1c | 0000 | 0000 | 5367 | 228c | b170 | 28c4 | 0012 | 0010 | b1d4 | 4e1c | 0000 | 0000 | 536f |
| 2144500 | 228c | 3355 | 28c4 | 0012 | 0010 | b1e8 | 4e1c | 0000 | 0000 | 4837 | 228c | 2020 | 28c4 | 0012 | 0010 | b1fc | 4e1c | 0000 | 0000 | 5377 | 228c | b1b0 | 28c4 | 0012 |
| 2144560 | 0010 | b210 | 4e1c | 0000 | 0000 | 537f | 228c | b1c0 | 28c4 | 0012 | 0010 | b224 | 4e1c | 0000 | 0000 | 5387 | 228c | 4604 | 28c4 | 0012 | 0010 | b238 | 4e1c | 0000 |
| 2144640 | 0000 | 538f | 228c | 2020 | 28c4 | 0012 | 0010 | b24c | 4e1c | 0000 | 0000 | 5397 | 228c | b1f8 | 28c4 | 0012 | 0010 | b250 | 4e1c | 0000 | 0000 | 539f | 228c | 4604 |
| 2144720 | 28c4 | 0012 | 0010 | b274 | 4e1c | 0000 | 0000 | 53a7 | 228c | 26f8 | 28c4 | 0012 | 0010 | b288 | 4e1c | 0000 | 0000 | 53af | 228c | 2020 | 28c4 | 0012 | 0010 | b29c |
| 2145000 | 4e1c | 0000 | 0000 | 53b7 | 228c | b250 | 28c4 | 0012 | 0010 | b2b0 | 4e1c | 0000 | 0000 | 53bf | 228c | b260 | 28c4 | 0012 | 0010 | b2c4 | 4e1c | 0000 | 0000 | 32e7 |
| 2145060 | 228c | 339d | 28c4 | 0012 | 0010 | b2d8 | 4e1c | 0000 | 0000 | 335f | 228c | 2020 | 28c4 | 0012 | 0010 | b2ec | 4e1c | 0000 | 0000 | 53c7 | 228c | b2a0 | 28c4 | 0012 |
| 2145140 | 0010 | b300 | 4e1c | 0000 | 0000 | 53cf | 228c | b2b0 | 28c4 | 0012 | 0010 | b314 | 4e1c | 0000 | 0000 | 53d7 | 228c | 33b1 | 2954 | 0012 | 0002 | 438a | 4e1c | 0000 |
| 2145220 | 0000 | 53df | 228c | 2020 | 2c78 | 0014 | 0002 | 438a | 5758 | 6b48 | 6bc8 | 22bc | 000c | 4c0c | 2c78 | 0014 | 0002 | 438a | 5758 | 6b48 | 6bc8 | 22bc | 000c | 64b4 |
| 2145300 | 0010 | d49c | 0000 | 002c | 0010 | f398 | b27c | b66c | 0000 | 07aa | 7fff | ffff | 0010 | 84b4 | 0200 | 0db5 | 0200 | 2f35 | 0000 | 5217 | 0000 | 031b | 0000 | 315f |
| 2145360 | 0000 | 002c | 0010 | f3c4 | b27c | b66c | 0000 | 08a2 | 7fff | ffff | 0010 | 84e0 | 0200 | 0db5 | 0200 | 224d | 0000 | 5217 | 0000 | 3287 | 0000 | 315f | 2c78 | 0014 |
| 2145440 | 0002 | 438a | 5d10 | 0000 | 0200 | 5d7f | 5f8c | 228c | 0010 | b510 | 0000 | 0100 | b27c | b66c | 0000 | 07ac | 0000 | 08a1 | 000a | d16d | 0200 | 0db5 | 0200 | 270d |
| 2145520 | 0000 | 5217 | 0000 | 3287 | 0000 | 315f | 0010 | b428 | 0000 | 0038 | b27c | b66c | 0000 | 07ad | 0000 | 08a3 | 0010 | b458 | 0200 | 0db5 | 0500 | 1cdd | 0000 | 55c7 |
| 2145600 | 0000 | 0013 | 0000 | 3287 | 0088 | 97c3 | 0000 | 031b | 0000 | 315f | 0010 | b454 | 0000 | 002e | b4f0 | b4e4 | 0000 | 07ac | 7fff | ffff | 0008 | b0dd | 0000 | 0000 |
| 2145660 | 0000 | 0000 | 000f | 9f20 | 0002 | 438a | 0011 | 751c | 0010 | b48c | 0000 | 0038 | b27c | b66c | 0000 | 07ae | 0000 | 08a4 | 0010 | b490 | 0200 | 0db5 | 0500 | 1cdd |
| 2145740 | 0000 | 55df | 0000 | 0013 | 0000 | 3287 | 0088 | 9d63 | 0000 | 031b | 0000 | 315f | 0010 | b510 | 0000 | 0038 | b27c | b66c | 0000 | 07af | 0000 | 08a5 | 0010 | b514 |
| 2146020 | 0200 | 0db5 | 0500 | 1cdd | 0000 | 55ef | 0000 | 001b | 0000 | 3287 | 0088 | a063 | 0000 | 031b | 0000 | 315f | 2c78 | 004a | 0002 | 438a | 45b8 | 4700 | 4754 | 2ba0 |
| 2146100 | 0018 | 000e | 3858 | 3804 | 2420 | 0000 | 0011 | 142c | 2c30 | 000e | 3858 | 3804 | 2420 | 0000 | 0011 | 144c | 2c58 | 379c | 56f8 | 4af8 | 0000 | 2ae7 | 6d50 | 3774 |
| 2146160 | 4e1c | 0000 | 0000 | 2ae7 | 723c | 3e20 | 0010 | b620 | 0000 | 00a8 | b27c | b66c | 0000 | 07b0 | 0000 | 08a6 | 0010 | b54c | 0200 | 01b5 | 0500 | 1cdd | 0000 | 5607 |
| 2146240 | 0000 | 001b | 0000 | 3287 | 0088 | a4c3 | 0000 | 031b | 0000 | 315f | 0010 | b580 | 0000 | 0038 | b27c | b66c | 0000 | 07b1 | 0000 | 08a7 | 0010 | b584 | 0200 | 0db5 |
| 2146320 | 0500 | 1cdd | 0000 | 5617 | 0000 | 001b | 0000 | 3287 | 0088 | a6c3 | 0000 | 031b | 0000 | 315f | 0010 | b620 | 0000 | 0038 | b27c | b66c | 0000 | 07b2 | 0000 | 08a8 |
| 2146400 | 0010 | b624 | 0200 | 0db5 | 0500 | 1cdd | 0000 | 561f | 0000 | 001b | 0000 | 3287 | 0088 | a963 | 0000 | 031b | 0000 | 315f | 2c78 | 0066 | 0002 | 438a | 45b8 | 4700 |
| 2146460 | 4754 | 2ba0 | 0018 | 001c | 379c | 56f8 | 4b8c | 0000 | 0000 | 0ab7 | 6d50 | 3774 | 4e1c | 0000 | 0000 | 0ab7 | 723c | 2c30 | 001a | 379c | 56f8 | 4af8 | 0000 | 0ad7 |
| 2146540 | 6d50 | 3774 | 4e1c | 0000 | 0000 | 0ad7 | 723c | 2c58 | 379c | 56f8 | 4b8c | 0000 | 0000 | 4ad7 | 6d50 | 3774 | 4e1c | 0000 | 0000 | 4ad7 | 723c | 2d3e | 0010 | b688 |
| 2146620 | 0000 | 0038 | b27c | b66c | 0000 | 07b3 | 0000 | 08a9 | 0010 | b68c | 0200 | 0db5 | 0500 | 1cdd | 0000 | 5627 | 0000 | 0013 | 0000 | 3287 | 0088 | ab43 | 0000 | 031b |
| 2146700 | 0000 | 315f | 2c78 | 0030 | 0002 | 438a | 2520 | 46d8 | 56f8 | 4af8 | 0000 | 0a0f | 671c | 332c | 24d0 | 0000 | 0011 | 1588 | 0014 | 3d00 | 56f8 | 4af8 | 0000 | 0a7f |
| 2146760 | 6d0c | 723c | 0010 | b720 | 0000 | 0038 | b27c | b66c | 0000 | 07b4 | 0000 | 08aa | 0010 | b724 | 0200 | 0db5 | 0500 | 1cdd | 0000 | 5637 | 0000 | 0013 | 0000 | 3287 |

```
2147040 0088 ade3 0000 031b 0000 315f 2c78 0060 0002 438a 2520 46d8 56f8 4af8 0000 5227 6750 33f4 31f0 247c 0011 15dc 001c 3d18
2147120 56f8 4af8 0000 04af 6750 33d8 31f0 247c 0011 13ec 0018 3d0c 56f8 4af8 0000 25d7 6750 33bc 31f0 247c 0011 144c 0014 3d00
2147200 56f8 4af8 0000 0ddf 6d0c 723c 0010 b7d8 0000 0070 b27c b66c 0000 07b5 0000 08ab 0010 b7dc 0200 04b5 0500 1cdd 0000 5647
2147260 0000 0013 0000 3287 0088 b0a3 0000 031b 0000 315f 0010 b7d8 0000 0038 b27c b66c 0000 07f4 0000 08ea 0010 9b40 0200 0db5
2147340 0500 1cdd 0000 59b7 0000 0013 0000 3287 0089 94c3 0000 031b 0000 315f 0011 bdf0 000a 33ac 2c78 0040 0002 438a 45c4 46d8
2147420 2ba0 0014 0018 3788 56f8 4af8 0000 294f 6750 3944 31f0 234c 0011 13ec 2c58 3788 56f8 4af8 0000 294f 671c 37dc 242c 0000
2147500 0011 14f8 0010 b8f8 0000 0038 b27c b66c 0000 07b6 0000 08ac 0010 b8fc 0200 0db5 0500 1cdd 0000 5657 0000 0013 0000 3287
2147560 0088 b6a3 0000 031b 0000 315f 2c78 00e8 0002 438a 2520 46d8 56f8 4af8 0000 5237 6750 3410 0034 32b8 24d0 0000 0011 15dc
2147640 0038 3df4 0034 56f8 4b8c 0000 0000 530f 6750 3410 0030 32f0 002c 247c 0011 144c 0034 3df4 0030 56f8 4b8c 0000 0000 25d7
2147720 6af0 0028 3e70 002c 3bf4 0000 0011 16f4 002c 3380 0024 3c9c 0000 0028 0011 1714 0028 3df4 0024 56f8 4b8c 0000 0000 524f
2150000 671c 3380 0020 247c 0011 1734 0024 3df4 0020 56f8 4b8c 0000 0000 52af 6af0 001c 2ba0 0020 0010 37c4 001c 318c 4a7c 0010
2150060 2c88 0020 2c58 33bc 382c 001c 32d4 247c 0011 1754 001c 3d48 40f4 0000 0011 1774 0014 3d00 56f8 4af8 0000 0ddf 6d0c 234c
2150140 0011 1794 0010 bb48 0000 00e0 b27c b66c 0000 07b7 0000 08ad 0010 b934 0200 0db5 0500 1cdd 0000 5667 0000 0013 0000 3287
2150220 0088 b8a3 0000 031b 0000 315f 0010 b968 0000 0038 b27c b66c 0000 07b8 0000 08ae 0010 b96c 0200 04b5 0500 1cdd 0000 566f
2150300 0000 0013 0000 3287 0088 b9a3 0000 031b 0000 315f 0010 b9a0 0000 0038 b27c b66c 0000 07b9 0000 08af 0010 b9a4 0200 0db5
2150360 0500 1cdd 0000 569f 0000 0013 0000 3287 0088 c623 0000 031b 0000 315f 0010 bb48 0000 0038 b27c b66c 0000 07ba 0000 08b0
2150440 0010 bb4c 0200 04b5 0500 1cdd 0000 56b7 0000 0013 0000 3287 0088 cae3 0000 031b 0000 315f 2c78 0170 0002 438a 2520 46d8
2150520 56f8 4af8 0000 146f 671c 3364 24d0 0000 0011 197c 001c 2ba0 001c 000e 37b0 31a4 4a7c 0014 2c88 001c 2c58 3d18 56f8 4af8
2150600 0000 5367 671c 3348 24d0 0000 0011 199c 0018 2ba0 0018 000e 379c 318c 4a7c 0010 2c88 001c 2c58 3d0c 56f8 4af8 0000 5377
2150660 671c 332c 24d0 0000 0011 199c 0014 3d00 56f8 4af8 0000 0ddf 6d0c 4538 4b8c 0000 0000 03a3 5370 4550 4b8c 0000 0000 0373
2150740 6b74 4538 4b8c 0000 0000 032b 6bb4 4550 4b8c 0000 0000 036b 6b74 4538 4b8c 0000 0000 032b 6bb4 4550 4b8c 0000 0000 03a3
2151020 6b74 4538 4b8c 0000 0000 030b 6bb4 4550 4b8c 0000 0000 03a3 6b74 4538 4b8c 0000 0000 039b 6bb4 4550 4b8c 0000 0000 02fb
2151100 6b74 4538 4b8c 0000 0000 0373 6bb4 4550 4b8c 0000 0000 037b 6b74 4538 4b8c 0000 0000 034b 6bb4 4550 4b8c 0000 0000 03a3
2151160 6b74 4538 4b8c 0000 0000 0393 6bb4 4550 4b8c 0000 0000 032b 6b74 4538 4b8c 0000 0000 039b 6bb4 4550 4b8c 0000 0000 039b
2151240 6b74 4538 4b8c 0000 0000 030b 6bb4 234c 0011 19bc 0010 bbe8 0000 0070 b27c b66c 0000 07bb 0000 08b1 0010 bb84 0200 0db5
2151320 0500 1cdd 0000 56cf 0000 001b 0000 3287 0088 cfa3 0000 031b 0000 315f 0010 bbe8 0000 0038 b27c b66c 0000 07bc 0000 08b2
2151400 0010 bbec 0200 04b5 0500 1cdd 0000 560f 0000 001b 0000 3287 0088 a5c3 0000 031b 0000 315f 2954 0030 0002 438a 56f8 671c
2151460 682c 4754 33d8 247c 0011 19f4 0018 3d0c 56f8 4af8 0000 0abf 6750 3858 2420 0000 0011 14b8 0010 bce8 0000 00b8 b27c b66c
2151540 0000 07bd 0000 08b3 0010 bcec 0200 0db5 0500 1cdd 0000 56d7 0000 0013 0000 3287 0088 d323 0000 031b 0000 315f 0010 bc58
2151620 0000 0038 b27c b66c 0000 07ce 0000 08c4 0010 d27c 0200 0db5 0500 1cdd 0000 580f 0000 0013 0000 3287 0089 1b03 0000 031b
2151700 0000 315f 0010 bc90 0000 0038 b27c b66c 0000 07d0 0000 08c6 0010 9cfc 0200 0db5 0500 1cdd 0000 582f 0000 0013 0000 3287
2151760 0089 2323 0000 031b 0000 315f 0010 bce8 0000 0010 0010 bc60 0000 0000 2c78 0048 0002 438a 2520 46d8 56f8 4af8 0000 5247
2152040 6750 33d8 31f0 247c 0011 15dc 0018 3d0c 56f8 4af8 0000 0daf 6750 33bc 31f0 247c 0011 1a84 0014 3d00 56f8 4af8 0000 0ddf
2152120 6d0c 723c 0010 bdc0 0000 0070 b27c b66c 0000 07be 0000 08b4 0010 bd24 0200 0db5 0500 1cdd 0000 56e7 0000 0013 0000 3287
2152200 0088 d5e3 0000 031b 0000 315f 0010 bdc0 0000 0038 b27c b66c 0000 07bf 0000 08b5 0010 bdc4 0200 0db5 0500 1cdd 0000 56ef
2152260 0000 0013 0000 3287 0088 d823 0000 031b 0000 315f 2c78 0068 0002 438a 2520 46d8 33f4 35c8 31f0 247c 0011 1b24 001c 3d18
2152340 56f8 4af8 0000 09ff 671c 3348 24d0 0000 0011 1abc 0018 2ba0 0018 000a 379c 4a7c 000c 723c 2c58 3d0c 56f8 4af8 0000 0a0f
2152420 6750 33bc 31f0 247c 0011 142c 0014 3d00 56f8 4af8 0000 0a7f 6d0c 723c 0010 be58 0000 0038 b27c b66c 0000 07c0 0000 08b6
2152500 0010 be5c 0200 04b5 0500 1cdd 0000 56ff 0000 0013 0000 3287 0088 dbc3 0000 031b 0000 315f 2c78 0060 0002 438a 2520 46d8
2152560 56f8 4af8 0000 5247 671c 3364 24d0 0000 0011 1abc 001c 3d18 56f8 4af8 0000 530f 671c 3348 24d0 0000 0011 1b98 0018 3d0c
2152640 56f8 4af8 0000 25d7 6750 33bc 31f0 247c 0011 142c 0014 3d00 56f8 4af8 0000 0ddf 6d0c 723c 0010 bf0c 0000 0070 b27c b66c
2152720 0000 07c1 0000 08b7 0010 be94 0200 0db5 0500 1cdd 0000 551f 0000 0013 0000 3287 0088 d1c3 0000 031b 0000 315f 0010 bf0c
2153000 0000 0038 b27c b66c 0000 07c2 0000 08b8 0010 bf10 0200 0db5 0500 1cdd 0000 570f 0000 0013 0000 3287 0088 e063 0000 031b
2153060 0000 315f 2c78 0044 0002 438a 45c4 46d8 2ba0 0014 0010 3788 56f8 4af8 0000 5557 6d0c 723c 2c30 0012 3788 56f8 4b8c 0000
2153140 0000 555f 6d0c 723c 2c58 3788 56f8 4af8 0000 5567 6d0c 723c 0010 bfbc 0000 0070 b27c b66c 0000 07c3 0000 08b9 0010 bf48
2153220 0200 0db5 0500 1cdd 0000 5717 0000 001b 0000 3287 0088 e223 0000 031b 0000 315f 0010 bfbc 0000 0038 b27c b66c 0000 07c4
2153300 0000 08ba 0010 bfc0 0200 04b5 0500 1cdd 0000 571f 0000 0013 0000 3287 0088 e4e3 0000 031b 0000 315f 2954 0040 0002 438a
2153360 2520 46ec 3348 247c 0011 1cbc 0018 2ba0 0018 000e 379c 3174 4a7c 000c 2c88 0010 2c58 3310 40f4 0000 0011 1cdc 0014 37f0
2153440 3cf4 234c 0011 1c9c 0010 c078 0000 0038 b27c b66c 0000 07c5 0000 08bb 0010 c07c 0200 0db5 0500 1cdd 0000 55d7 0000 0013
2153520 0000 3287 0088 9ac3 0000 031b 0000 315f 2c78 0084 0002 438a 2520 46ec 3380 001c 24d0 0000 0011 1bb8 0020 3df4 001c 56f8
2153600 4b8c 0000 0000 08a7 671c 3364 24d0 0000 0011 1c9c 001c 2ba0 001c 000e 37b0 31a4 4a7c 0014 2c88 001c 2c58 3d18 56f8 4af8
2153660 0000 000f 671c 3348 24d0 0000 0011 1c9c 0018 3d0c 56f8 4af8 0000 08a7 69b0 2ba0 0014 000a 3774 4a7c 0010 723c 2c58 2330
2153740 0011 1cfc 0010 c124 0000 0070 b27c b66c 0000 07c6 0000 08bc 0010 c0b4 0200 0db5 0500 1cdd 0000 5737 0000 001b 0000 3287
2154020 0088 ea63 0000 031b 0000 315f 0010 c124 0000 0038 b27c b66c 0000 07c7 0000 08bd 0010 c128 0200 0db5 0500 1cdd 0000 573f
2154100 0000 001b 0000 3287 0088 ec83 0000 031b 0000 315f 2c78 003c 0002 438a 45b8 46ec 4768 2ba0 0018 000a 23fc 0000 0011 1dec
```

```
2154160 2c30 000a 23fc 0000 0010 d724 2c30 000a 23fc 0000 0011 1e0c 2c58 231c 0011 1e2c 0010 c1ac 0000 0038 b27c b66c 0000 07c8
2154240 0000 08be 0010 c1b0 0200 0db5 0500 1cdd 0000 575f 0000 0013 0000 3287 0088 f483 0000 031b 0000 315f 2c78 0050 0002 438a
2154320 2520 46ec 3348 247c 0011 1eb0 0018 2ba0 0018 000e 379c 3174 4a7c 000c 2c88 0010 2c58 3310 40f4 0000 0011 1ed0 0014 2ba0
2154400 0014 000a 3774 4a7c 0010 723c 2c58 37f0 3cf4 234c 0011 1ef0 0010 c220 0000 0038 b27c b66c 0000 07c9 0000 08bf 0010 c224
2154460 0200 0db5 0500 1cdd 0000 577f 0000 0013 0000 3287 0088 f943 0000 031b 0000 315f 2c78 003c 0002 438a 2520 46d8 3348 247c
2154540 0011 1c0c 0018 340c 56f8 4af8 0000 0857 671c 332c 24d0 0000 0011 1f48 0014 3d00 56f8 4af8 0000 0857 6d0c 723c 0010 c298
2154620 0000 0038 b27c b66c 0000 07ca 0000 08c0 0010 c29c 0200 0db5 0500 1cdd 0000 5787 0000 0013 0000 3287 0088 fa43 0000 031b
2154700 0000 315f 2954 0040 0002 438a 2520 46ec 3348 247c 0011 1cbc 0018 2ba0 0018 000e 379c 3174 4a7c 000c 2c88 0010 2c58 3310
2154760 40f4 0000 0011 1cdc 0014 37f0 3cf4 234c 0011 1f48 0010 c438 0000 0038 b27c b66c 0000 07cb 0000 08c1 0010 c43c 0200 0db5
2155040 0500 1cdd 0000 578f 0000 0013 0000 3287 0088 fe43 0000 031b 0000 315f 2c78 0168 0002 438a 2520 46d8 56f8 4af8 0000 52bf
2155120 671c 3364 24d0 0000 0011 1fe8 001c 2ba0 001c 000e 37b0 31a4 4a7c 0014 2c88 0010 2c58 3348 4108 0000 0011 2008 0018 2ba0
2155200 0018 000e 379c 318c 4a7c 0010 2c88 0010 2c58 332c 40f4 0000 0011 2028 0014 3d00 56f8 4af8 0000 52af 55f0 4af8 0000 52bf
2155260 55f0 4af8 0000 0ddf 6d0c 4538 4b8c 0000 0000 0373 5370 4550 4b8c 0000 0000 037b 6b74 4538 4b8c 0000 0000 034b 6bb4 4550
2155340 4b8c 0000 0000 03a3 6b74 4538 4b8c 0000 0000 030b 6bb4 4550 4b8c 0000 0000 0393 6b74 4538 4b8c 0000 0000 03ab 6bb4 4550
2155420 4b8c 0000 0000 033b 6b74 4538 4b8c 0000 0000 034b 6bb4 4550 4b8c 0000 0000 0333 6b74 4538 4b8c 0000 0000 0373 6bb4 4550
2155500 4b8c 0000 0000 037b 6b74 4538 4b8c 0000 0000 031b 6bb4 4550 4b8c 0000 0000 02fb 6b74 4538 4b8c 0000 0000 035b 6bb4 4550
2155560 4b8c 0000 0000 031b 6b74 4538 4b8c 0000 0000 037b 6bb4 4550 4b8c 0000 0000 0363 6b74 4538 4b8c 0000 0000 0313 6bb4 234c
2155640 0011 19bc 0010 d094 0000 0038 b27c b66c 0000 07cc 0000 08c2 0010 d098 0200 0db5 0500 1cdd 0000 568f 0000 0013 0000 3287
2155720 0088 bf83 0000 031b 0000 315f 2c78 0c24 0002 438a 45b8 46ec 2ba0 0014 00d4 37f0 3b4c 0000 0011 2160 0014 2ecc 4550 4af8
2156000 0000 0373 5370 4538 4b8c 0000 0000 037b 6bb4 4550 4b8c 0000 0000 034b 6b74 4538 4b8c 0000 0000 03a3 6bb4 4550 4b8c 0000
2156060 0000 030b 6b74 4538 4b8c 0000 0000 0393 6bb4 4550 4b8c 0000 0000 030b 6b74 4538 4b8c 0000 0000 0363 6bb4 4550 4b8c 0000
2156140 0000 031b 6b74 4538 4b8c 0000 0000 032b 6bb4 4550 4b8c 0000 0000 0323 6b74 4538 4b8c 0000 0000 02fb 6bb4 4550 4b8c 0000
2156220 0000 032b 6b74 4538 4b8c 0000 0000 0383 6bb4 4550 4b8c 0000 0000 03cb 6b74 4538 4b8c 0000 0000 03a3 6bb4 234c 0011 19bc
2156300 2c30 000e 37f0 39a4 0011 2180 0014 2eb0 2c30 000e 37f0 39a4 0011 21a0 0014 2eb0 2c30 00f6 37f0 39a4 0011 21c0 0014 2ecc
2156360 4538 4af8 0000 0373 5370 4550 4b8c 0000 0000 037b 6b74 4538 4b8c 0000 0000 034b 6bb4 4550 4b8c 0000 0000 03a3 6b74 4538
2156440 4b8c 0000 0000 030b 6bb4 4550 4b8c 0000 0000 0393 6b74 4538 4b8c 0000 0000 030b 6bb4 4550 4b8c 0000 0000 0363 6b74 4538
2156520 4b8c 0000 0000 031b 6bb4 4550 4b8c 0000 0000 032b 6b74 4538 4b8c 0000 0000 0323 6bb4 4550 4b8c 0000 0000 02fb 6b74 4538
2156600 4b8c 0000 0000 032b 6bb4 4550 4b8c 0000 0000 0383 6b74 4538 4b8c 0000 0000 03cb 6bb4 4550 4b8c 0000 0000 03a3 6b74 4538
2156660 4b8c 0000 0000 0313 6bb4 4550 4b8c 0000 0000 03ab 6b74 4538 4b8c 0000 0000 039b 6bb4 234c 0011 19bc 2c30 0102 37f0 39a4
2156740 0011 21e0 0014 2ecc 4550 4af8 0000 0373 5370 4538 4b8c 0000 0000 037b 6bb4 4550 4b8c 0000 0000 034b 6b74 4538 4b8c 0000
2157020 0000 03a3 6bb4 4550 4b8c 0000 0000 030b 6b74 4538 4b8c 0000 0000 0393 6bb4 4550 4b8c 0000 0000 030b 6b74 4538 4b8c 0000
2157100 0000 0363 6bb4 4550 4b8c 0000 0000 031b 6b74 4538 4b8c 0000 0000 032b 6bb4 4550 4b8c 0000 0000 0323 6b74 4538 4b8c 0000
2157160 0000 02fb 6bb4 4550 4b8c 0000 0000 03a3 6b74 4538 4b8c 0000 0000 0373 6bb4 4550 4b8c 0000 0000 030b 6b74 4538 4b8c 0000
2157240 0000 03a3 6bb4 4550 4b8c 0000 0000 039b 6b74 4538 4b8c 0000 0000 0373 6bb4 4550 4b8c 0000 0000 037b 6b74 4538 4b8c 0000
2157320 0000 031b 6bb4 234c 0011 19bc 2c30 00ea 37f0 39a4 0011 2200 0014 2ecc 4550 4af8 0000 0373 5370 4538 4b8c 0000 0000 037b
2157400 6bb4 4550 4b8c 0000 0000 034b 6b74 4538 4b8c 0000 0000 03a3 6bb4 4550 4b8c 0000 0000 030b 6b74 4538 4b8c 0000 0000 0393
2157460 6bb4 4550 4b8c 0000 0000 030b 6b74 4538 4b8c 0000 0000 0363 6bb4 4550 4b8c 0000 0000 031b 6b74 4538 4b8c 0000 0000 032b
2157540 6bb4 4550 4b8c 0000 0000 0323 6b74 4538 4b8c 0000 0000 02fb 6bb4 4550 4b8c 0000 0000 0363 6b74 4538 4b8c 0000 0000 030b
2157620 6bb4 4550 4b8c 0000 0000 0373 6b74 4538 4b8c 0000 0000 033b 6bb4 4550 4b8c 0000 0000 034b 6b74 4538 4b8c 0000 0000 039b
2157700 6bb4 234c 0011 19bc 2c30 00d2 37f0 39a4 0011 2220 0014 2ecc 4550 4af8 0000 0373 5370 4538 4b8c 0000 0000 037b 6bb4 4550
2157760 4b6c 0000 0000 034b 6b74 4538 4b8c 0000 0000 03a3 6bb4 4550 4b8c 0000 0000 030b 6b74 4538 4b8c 0000 0000 0393 6bb4 4550
2160040 4b8c 0000 0000 030b 6b74 4538 4b8c 0000 0000 0363 6bb4 4550 4b8c 0000 0000 031b 6b74 4538 4b8c 0000 0000 032b 6bb4 4550
2160120 4b8c 0000 0000 0323 6b74 4538 4b8c 0000 0000 02fb 6bb4 4550 4b8c 0000 0000 032b 6b74 4538 4b8c 0000 0000 0363 6bb4 4550
2160200 4b8c 0000 0000 034b 6b74 4538 4b6c 0000 0000 0333 6bb4 234c 0011 19bc 2c30 00de 37f0 39a4 0011 15bc 0014 2ecc 4538 4af8
2160260 0000 0373 5370 4550 4b8c 0000 0000 037b 6b74 4538 4b8c 0000 0000 034b 6bb4 4550 4b8c 0000 0000 03a3 6b74 4538 4b8c 0000
2160340 0000 030b 6bb4 4550 4b8c 0000 0000 0393 6b74 4538 4b8c 0000 0000 030b 6bb4 4550 4b8c 0000 0000 0363 6b74 4538 4b8c 0000
2160420 0000 031b 6bb4 4550 4b8c 0000 0000 032b 6b74 4538 4b8c 0000 0000 0323 6bb4 4550 4b8c 0000 0000 02fb 6b74 4538 4b8c 0000
2160500 0000 039b 6bb4 4550 4b8c 0000 0000 030b 6b74 4538 4b8c 0000 0000 034b 6bb4 4550 4b8c 0000 0000 0363 6b74 4538 4b8c 0000
2160560 0000 030b 6bb4 234c 0011 19bc 2c30 010e 37f0 39a4 0011 2240 0014 2ecc 4538 4af8 0000 0373 5370 4550 4b8c 0000 0000 037b
2160640 6b74 4538 4b8c 0000 0000 034b 6bb4 4550 4b8c 0000 0000 03a3 6b74 4538 4b8c 0000 0000 030b 6bb4 4550 4b8c 0000 0000 0393
2160720 6b74 4538 4b8c 0000 0000 030b 6bb4 4550 4b8c 0000 0000 0363 6b74 4538 4b8c 0000 0000 031b 6bb4 4550 4b8c 0000 0000 032b
2161000 6b74 4538 4b8c 0000 0000 0323 6bb4 4550 4b8c 0000 0000 02fb 6b74 4538 4b8c 0000 0000 03a3 6bb4 4550 4b8c 0000 0000 0373
2161060 6b74 4538 4b8c 0000 0000 032b 6bb4 4550 4b8c 0000 0000 0373 6b74 4538 4b8c 0000 0000 037b 6bb4 4550 4b8c 0000 0000 0383
2161140 6b74 4538 4b8c 0000 0000 036b 6bb4 4550 4b8c 0000 0000 037b 6b74 4538 4b8c 0000 0000 031b 6bb4 234c 0011 19bc 2c30 010e
2161220 37f0 39a4 0011 1a64 0014 2ecc 4538 4af8 0000 0373 5370 4550 4b8c 0000 0000 037b 6b74 4538 4b8c 0000 0000 034b 6bb4 4550
```

```
2161300 4b8c 0000 0000 03a3 6b74 4538 4b8c 0000 0000 030b 6bb4 4550 4b8c 0000 0000 0393 6b74 4538 4b8c 0000 0000 030b 6bb4 4550
2161360 4b8c 0000 0000 0363 6b74 4538 4b8c 0000 0000 031b 6bb4 4550 4b8c 0000 0000 032b 6b74 4538 4b8c 0000 0000 0323 6bb4 4550
2161440 4b8c 0000 0000 02fb 6b74 4538 4b8c 0000 0000 032b 6bb4 4550 4b8c 0000 0000 03a3 6b74 4538 4b8c 0000 0000 03ab 6bb4 4550
2161520 4b8c 0000 0000 0313 6b74 4538 4b8c 0000 0000 034b 6bb4 4550 4b8c 0000 0000 0393 6b74 4538 4b8c 0000 0000 03a3 6bb4 4550
2161600 4b8c 0000 0000 03a3 6b74 4538 4b8c 0000 0000 030b 6bb4 234c 0011 19bc 2c30 0126 37f0 39a4 0011 1b78 0014 2ecc 4538 4af8
2161660 0000 0373 5370 4550 4b8c 0000 0000 037b 6b74 4538 4b8c 0000 0000 034b 6bb4 4550 4b8c 0000 0000 03a3 6b74 4538 4b8c 0000
2161740 0000 030b 6bb4 4550 4b8c 0000 0000 031b 6b74 4538 4b8c 0000 0000 034b 6bb4 4550 4b8c 0000 0000 0333 6b74 4538 4b8c 0000
2162020 0000 034b 6bb4 4550 4b8c 0000 0000 031b 6b74 4538 4b8c 0000 0000 032b 6bb4 4550 4b8c 0000 0000 0383 6b74 4538 4b8c 0000
2162100 0000 039b 6bb4 4550 4b8c 0000 0000 02fb 6b74 4538 4b8c 0000 0000 032b 6bb4 4550 4b8c 0000 0000 03a3 6b74 4538 4b8c 0000
2162160 0000 03ab 6bb4 4550 4b8c 0000 0000 0313 6b74 4538 4b8c 0000 0000 034b 6bb4 4550 4b8c 0000 0000 0393 6b74 4538 4b8c 0000
2162240 0000 03a3 6bb4 4550 4b8c 0000 0000 03a3 6b74 4538 4b8c 0000 0000 030b 6bb4 234c 0011 19bc 2c30 0156 37f0 39a4 0011 2260
2162320 0014 2ecc 4538 4af8 0000 0373 5370 4550 4b8c 0000 0000 037b 6b74 4538 4b8c 0000 0000 034b 6bb4 4550 4b8c 0000 0000 03a3
2162400 6b74 4538 4b8c 0000 0000 030b 6bb4 4550 4b8c 0000 0000 031b 6b74 4538 4b8c 0000 0000 034b 6bb4 4550 4b8c 0000 0000 0333
2162460 6b74 4538 4b8c 0000 0000 034b 6bb4 4550 4b8c 0000 0000 031b 6b74 4538 4b8c 0000 0000 032b 6bb4 4550 4b8c 0000 0000 0383
2162540 6b74 4538 4b8c 0000 0000 039b 6bb4 4550 4b8c 0000 0000 02fb 6b74 4538 4b8c 0000 0000 0373 6bb4 4550 4b8c 0000 0000 037b
2162620 6b74 4538 4b8c 0000 0000 034b 6bb4 4550 4b8c 0000 0000 03a3 6b74 4538 4b8c 0000 0000 030b 6bb4 4550 4b8c 0000 0000 0393
2162700 6b74 4538 4b8c 0000 0000 03ab 6bb4 4550 4b8c 0000 0000 033b 6b74 4538 4b8c 0000 0000 034b 6bb4 4550 4b8c 0000 0000 0333
2162760 6b74 4538 4b8c 0000 0000 0373 6bb4 4550 4b8c 0000 0000 037b 6b74 4538 4b8c 0000 0000 031b 6bb4 234c 0011 19bc 2c30 0156
2163040 37f0 39a4 0011 2280 0014 2ecc 4538 4af8 0000 0373 5370 4550 4b8c 0000 0000 037b 6b74 4538 4b8c 0000 0000 034b 6bb4 4550
2163120 4b8c 0000 0000 03a3 6b74 4538 4b8c 0000 0000 030b 6bb4 4550 4b8c 0000 0000 031b 6b74 4538 4b8c 0000 0000 034b 6bb4 4550
2163200 4b8c 0000 0000 0333 6b74 4538 4b8c 0000 0000 034b 6bb4 4550 4b8c 0000 0000 031b 6b74 4538 4b8c 0000 0000 032b 6bb4 4550
2163260 4b8c 0000 0000 0383 6b74 4538 4b8c 0000 0000 039b 6bb4 4550 4b8c 0000 0000 02fb 6b74 4538 4b8c 0000 0000 0373 6bb4 4550
2163340 4b8c 0000 0000 037b 6b74 4538 4b8c 0000 0000 034b 6bb4 4550 4b8c 0000 0000 03a3 6b74 4538 4b8c 0000 0000 031b 6bb4 4550
2163420 4b8c 0000 0000 032b 6b74 4538 4b8c 0000 0000 0373 6bb4 4550 4b8c 0000 0000 0373 6b74 4538 4b8c 0000 0000 037b 6bb4 4550
2163500 4b8c 0000 0000 031b 6b74 4538 4b8c 0000 0000 039b 6bb4 4550 4b8c 0000 0000 034b 6b74 4538 4b8c 0000 0000 0323 6bb4 234c
2163560 0011 19bc 2c58 37f0 3b4c 0000 0011 22a0 000c 2ecc 4550 4ae8 0000 032b 5370 4538 4b8c 0000 0000 039b 6bb4 4550 4b8c 0000
2163640 0000 03ab 6b74 4538 4b8c 0000 0000 030b 6bb4 4550 4b8c 0000 0000 0363 6b74 4538 4b8c 0000 0000 031b 6bb4 4550 4b8c 0000
2163720 0000 02fb 6b74 4538 4b8c 0000 0000 032b 6bb4 4550 4b8c 0000 0000 039b 6b74 4538 4b8c 0000 0000 03ab 6bb4 234c 0011 19bc
2164000 0010 d104 0000 0038 b27c b66c 0000 07cd 0000 08c3 0010 bc24 0200 0db5 0500 1cdd 0000 5807 0000 0013 0000 3287 0089 16e3
2164060 0000 031b 0000 315f 2c78 0038 0002 438a 2520 46d8 56f8 4af8 0000 523f 671c 332c 24d0 0000 0011 2f7c 0014 3d00 56f8 4af8
2164140 0000 530f 6750 3844 31f0 234c 0011 13ec 0010 d278 0000 00a8 b27c b66c 0000 07ee 0000 08e4 0010 d140 0200 0db5 0500 1cdd
2164220 0000 595f 0000 0013 0000 3287 0089 7e03 0000 031b 0000 315f 0010 d174 0000 0038 b27c b66c 0000 07ef 0000 08e5 0010 d178
2164300 0200 0db5 0500 1cdd 0000 596f 0000 0013 0000 3287 0089 8223 0000 031b 0000 315f 0010 d278 0000 0038 b27c b66c 0000 07f0
2164360 0000 08e6 0010 6118 0200 0db5 0500 1cdd 0000 5977 0000 0013 0000 3287 0089 8523 0000 031b 0000 315f 2c78 0020 0002 438a
2164440 45b8 46ec 2ba0 0014 0008 2330 0011 30e8 2c58 2330 0011 22a0 2c78 00ac 0002 438a 45e8 0024 46d8 2ba0 0028 0010 37c4 0024
2164520 31bc 4a7c 0018 2c88 0048 2c58 3380 0020 3af4 0024 0011 2390 0024 2ba0 0024 0010 37c4 0020 31bc 4a7c 0018 2c88 0024 2c58
2164600 3380 001c 40b4 0020 0011 1ed0 0020 3df4 001c 55f8 4b8c 0000 0000 0ddf 6aa0 bfcc 2ba0 001c 000a 37b0 4a7c 000c 723c 2c58
2164660 3348 3aa0 0011 23b0 0018 2ba0 0018 000a 379c 4a7c 000c 723c 2c58 332c 40f4 0000 0011 1ef0 0014 3d00 56f8 4af8 0000 0ddf
2164740 6d0c 723c 0010 d334 0000 0038 b27c b66c 0000 07cf 0000 08c5 0010 bc5c 0200 0db5 0500 1cdd 0000 5797 0000 0013 0000 3287
2165020 0088 ff43 0000 031b 0000 315f 2c78 0084 0002 438a 45e8 001c 46d8 2ba0 0020 0012 3844 382c 001c 31f0 242c 0000 0011 144c
2165100 2c30 0012 3844 382c 001c 32d4 242c 0000 0011 23f8 2c58 33d8 382c 001c 31f0 46ac 24d0 0000 0011 23f8 0018 2ba0 0018 000a
2165160 379c 4a7c 000c 723c 2c58 3d0c 56f8 4af8 0000 0a0f 671c 332c 24d0 0000 0011 2418 0014 3d00 56f8 4af8 0000 0a7f 6d0c 723c
2165240 0010 f2e4 0000 002c 000f 4186 000f 417e 000f 3c81 0000 00cf 0010 d318 0005 1c94 0010 d318 0005 2020 0010 34ac 2c78 0020
2165320 0002 438a 45b8 46ec 4768 42ac 0000 53ff 0010 d38c 0018 231c 0010 d3ac 0008 c38c 0100 53f7 0000 3287 0000 0004 0011 b540
2165400 0011 b748 0001 0064 0000 0000 ffff ffff 0300 5407 0000 3287 0000 000c 0010 85e0 0010 85e0 0001 0062 0000 0000 000c 085c
2165460 0200 540f 0000 3287 0000 0008 0010 d87c 000f 99e8 0001 0062 0000 0000 0008 c42c 0300 5417 0000 3287 0000 000c 0010 d46c
2165540 0010 d46c 0001 0062 0000 0000 ffff ffff 0200 541f 0000 3287 0000 0008 0010 efbc 0010 efbc 0001 0062 0000 0000 000d 656e
2165620 7469 7479 5f61 7370 6563 7400 0008 c44c 0200 5427 0000 3287 0000 0008 0010 86c8 000f d5bc 0001 0062 0000 0000 0008 c46c
2165700 0300 542f 0000 3287 0000 000c 0010 d5cc 0010 d65c 0001 0062 0000 0000 2cac d420 0002 438a 2ca0 0000 0000 0000 0000 0001
2165760 0010 8648 0010 d490 0010 8652 0010 b350 2954 0016 0002 438a 4e1c 0000 0000 0007 3574 48c0 7220 4154 000b 656e 645f 6f66
2166040 5f6c 696e 6500 4154 2b24 6ed9 0002 439a 0013 fc4a 0012 eef0 ffff ffff 0300 5437 0000 3287 0000 000c 0010 d590 0010 d590
2166120 0001 0062 0000 0000 ffff ffff 0200 543f 0000 3287 0000 0008 0010 da9c 0010 da9c 0001 0062 0000 0000 000c 6772 6170 6869
2166200 635f 6368 6172 0054 0007 5173 7973 7465 6d00 6ed4 0013 359c ffff ffff 0300 5477 0000 3287 0000 000c 0010 d754 0010 d754
2166260 0001 0062 0000 0000 27f0 0028 0010 d5b4 56f8 671c 682c 4768 33bc 247c 0010 d580 0018 2ecc 386c 3d30 2420 0000 0010 d4d8
2166340 0008 c4ac 0300 5447 0000 3287 0000 000c 0010 e9b4 0010 ea8c 0001 0062 0000 0000 2cac 34ac 0002 438a 2ca0 d550 0000 0000
```

```
2166420 0000 0001 0010 d548 0010 d5b4 0010 d552 0010 aac8 2954 0016 0002 438a 4e1c 0000 0000 0007 3574 48c0 7220 d598 27f0 0010
2166500 0010 d5fc 239c 0000 0010 d5ec ffff ffff 0300 544f 0000 3287 0000 000c 0010 de34 0010 df04 0001 0062 0000 0000 28c4 0020
2166560 0010 d65c 45c4 3280 2410 0000 0010 d62c 0014 37f0 3cf4 234c 0010 d64c ffff ffff 0300 337f 0000 3287 0000 000c 0010 d6dc
2166640 0010 d6dc 0001 0062 0000 0000 ffff ffff 0200 5457 0000 3287 0000 0008 0010 d800 0010 d800 0001 0062 0000 0000 2954 0010
2166720 0002 438a 239c 0000 0010 d67c 0008 c4cc 0300 545f 0000 3287 0000 000c 0010 dafc 0010 dafc 0001 0062 0000 0000 000b 6461
2167000 7461 6261 7365 2e70 6c00 0000 ffff ffff 0300 5467 0000 3287 0000 000c 0010 b328 0010 b328 0001 0062 0000 0000 ffff ffff
2167060 0300 546f 0000 3287 0000 000c 0010 d788 0010 d788 0001 0062 0000 0000 2cac 1b9c 0002 438a 2ca0 4104 0000 0000 0000 0000
2167140 0010 87a8 0010 87a8 0010 87b2 0010 d700 0000 0000 0000 62f7 b328 0010 0012 51e4 0000 0000 0010 40dc 0300 20df 0000 3287
2167220 0000 000c 0010 b33c 0010 b33c 0001 0062 0000 0000 0000 6d37 b328 0010 0013 e890 0000 0000 27f0 0010 0010 bf78 239c 0000
2167300 0011 1cbc 2c78 0024 0002 438a 3690 3574 56f8 6c08 6bc8 4538 6c08 5370 56f8 4af8 0000 02fb 5370 7220 000e 1b8d 0000 0000
2167360 0010 18cd 0000 0000 2cac 40f8 0002 438a 2ca0 90dc 0000 0000 0000 0001 0010 8900 0010 d7d8 000e 7470 0010 d7ac 0010 d7e4
2167440 28c4 0028 0010 d7d8 56f8 671c 682c 4768 33bc 247c 0010 d724 0018 2ecc 386c 3d30 2420 0000 0010 d6cc 2954 0016 0002 438a
2167520 4e1c 0000 0000 0007 3574 48c0 7220 401e 000d 6261 7365 645f 696e 7465 6765 7200 2c78 0024 0002 438a 2520 46ec 35c8 3280
2167600 24d0 0000 0008 cefc 0014 37f0 3cf4 234c 0010 d834 0008 c4ec 0200 547f 0000 3287 0000 0008 0010 d854 000f 9b5c 0001 0062
2167660 0000 0000 0000 62f7 b328 0000 0012 5210 0000 0000 27f0 0018 000f 9b5c 48f8 2520 24d0 0000 0010 acbc 000c 2eb0 000d 656e
2167740 7469 7479 5f6e 756d 6265 7200 27f0 0020 000f 99e8 2520 46ec 3310 247c 0010 d8ac 0014 37f0 3cf4 234c 0010 d3cc 0008 c50c
2170020 0200 5487 0000 3287 0000 0008 0010 d8dc 0010 d950 0001 0062 0000 0000 000a 7370 6163 655f 6368 6172 000f 40d0 2c78 0010
2170100 0002 438a 239c 0000 0011 1bd9 27f0 0010 0010 d920 239c 0000 0010 d8fc ffff ffff 0200 548f 0000 3287 0000 0008 0010 d984
2170160 0010 d984 0001 0062 0000 0000 000f 666f 726d 6174 5f65 6666 6563 746f 7200 d8d0 28c4 0010 0010 d950 239c 0000 0010 d940
2170240 ffff ffff 0200 5497 0000 3287 0000 0008 0010 da28 0010 da28 0001 0062 0000 0000 2954 0010 0002 438a 239c 0000 0010 d4f8
2170320 000d 6672 6565 5f6f 7065 7261 746f 7200 2c78 0014 0002 438a 56f8 4af8 0000 0103 6b88 7220 2cac 1fb7 0002 438a 2ca0 1c94
2170400 0000 0000 0000 0000 0010 d970 0010 d970 0010 d97a 0010 d9a8 0000 0000 ffff ffff 0200 549f 0000 3287 0000 0008 0010 d9f0
2170460 0010 d9f0 0001 0062 0000 0000 0000 6307 b328 0000 0012 7a28 0000 0000 2c78 0014 0002 438a 56f8 4af8 0000 004b 6b88 7220
2170540 2cac 34ac 0002 438a 2ca0 d9b0 0000 0000 0000 0000 0010 d9dc 0010 d9dc 0010 d9e6 0010 da14 0000 0000 000a 6578 7072 6573
2170620 7369 6f6e 0000 0000 2c78 0010 0002 438a 239c 0000 0010 d9bc 000a 696e 6372 5f63 6f75 6e74 000f 408c 000c 6573 7469 6d61
2170700 746f 722e 706c 0000 2c78 0024 0002 438a 56f8 4af8 0000 0053 6b88 3050 4240 0000 0000 53ff 239c 0000 0010 da8c ffff ffff
2170760 0100 54a7 0000 3287 0000 0004 0011 b9c4 0011 bbc8 0001 0064 0000 0000 2cac 1b9c 0002 438a 2ca0 4084 0000 0000 0000 0000
2171040 0010 da58 0010 da58 0010 da62 0010 dac0 0000 0000 000a f819 0000 0000 000b 025d 0000 0000 27f0 0028 0010 db24 4e1c 0000
2171120 0000 54af 3574 56f8 4b8c 0000 0000 01eb 55f0 4af8 0000 01f3 6bc8 7220 2cac dab0 0002 438a 2ca0 0000 0000 007c 0000 0017
2171200 0010 dad4 0010 de04 0002 438a 0010 8c44 0010 dfe8 28c4 0028 0010 db4c 4e1c 0000 0000 0a8f 3574 56f8 4b8c 0000 0000 0153
2171260 55f0 4af8 0000 0153 6bc8 7220 28c4 0028 0010 db84 4e1c 0000 0000 0dd7 3574 56f8 4b8c 0000 0000 01d3 55f0 4af8 0000 01eb
2171340 6bc8 7220 000b 6465 6369 6d61 6c5f 6c69 7400 0000 28c4 0028 0010 dbac 4e1c 0000 0000 54b7 3574 56f8 4b8c 0000 0000 017b
2171420 55f0 4af8 0000 01eb 6bc8 7220 28c4 0028 0010 dbf4 4e1c 0000 0000 0e2f 3574 56f8 4b8c 0000 0000 01f3 55f0 4af8 0000 01eb
2171500 6bc8 7220 28c4 0020 0010 dc84 4e1c 0000 0000 0a0f 3574 56f8 4b8c 0000 0000 0143 6bc8 7220 28c4 0028 0010 dc1c 4e1c 0000
2171560 0000 54bf 3574 56f8 4b8c 0000 0000 01e3 55f0 4af8 0000 01eb 6bc8 7220 28c4 0028 0010 dc44 4e1c 0000 0000 54c7 3574 56f8
2171640 4b8c 0000 0000 01e3 55f0 4af8 0000 01f3 6bc8 7220 28c4 0020 0010 dc64 4e1c 0000 0000 4ad7 3574 56f8 4b8c 0000 0000 0133
2171720 6bc8 7220 28c4 0020 0010 dbd4 4e1c 0000 0000 09ff 3574 56f8 4b8c 0000 0000 013b 6bc8 7220 28c4 0020 0010 dca4 4e1c 0000
2172000 0000 0a7f 3574 56f8 4b8c 0000 0000 014b 6bc8 7220 28c4 0020 0010 dcc4 4e1c 0000 0000 0a87 3574 56f8 4b8c 0000 0000 0153
2172060 6bc8 7220 28c4 0020 0010 dce4 4e1c 0000 0000 0ab7 3574 56f8 4b8c 0000 0000 015b 6bc8 7220 28c4 0020 0010 dd04 4e1c 0000
2172140 0000 0abf 3574 56f8 4b8c 0000 0000 0163 6bc8 7220 28c4 0020 0010 dd24 4e1c 0000 0000 0ad7 3574 56f8 4b8c 0000 0000 016b
2172220 6bc8 7220 28c4 0020 0010 dd44 4e1c 0000 0000 000f 3574 56f8 4b8c 0000 0000 0173 6bc8 7220 28c4 0020 0010 dd64 4e1c 0000
2172300 0000 0b3f 3574 56f8 4b8c 0000 0000 017b 6bc8 7220 28c4 0020 0010 dd84 4e1c 0000 0000 0daf 3574 56f8 4b8c 0000 0000 01d3
2172360 6bc8 7220 28c4 0020 0010 dda4 4e1c 0000 0000 0ddf 3574 56f8 4b8c 0000 0000 01db 6bc8 7220 28c4 0020 0010 ddc4 4e1c 0000
2172440 0000 0de7 3574 56f8 4b8c 0000 0000 01e3 6bc8 7220 28c4 0020 0010 dde4 4e1c 0000 0000 0df7 3574 56f8 4b8c 0000 0000 01eb
2172520 6bc8 7220 28c4 0020 0010 de04 4e1c 0000 0000 0e27 3574 56f8 4b8c 0000 0000 01f3 6bc8 7220 2954 0020 0002 438a 4e1c 0000
2172600 0000 3407 3574 56f8 4b8c 0000 0000 03e3 6bc8 7220 27f0 0010 000b 7b98 239c 0000 000b 7a14 27f0 0010 0010 de64 239c 0000
2172660 0010 de54 ffff ffff 0300 54cf 0000 3287 0000 000c 0010 dfc4 0010 dfc4 0001 0062 0000 0000 28c4 0010 0010 de94 239c 0000
2172740 0010 de84 ffff ffff 0300 54d7 0000 3287 0000 000c 0010 e320 0010 e320 0001 0062 0000 0000 28c4 0010 0010 ded4 239c 0000
2173020 0010 deb4 0008 c56c 0300 54df 0000 3287 0000 000c 0010 e56c 0010 e56c 0001 0062 0000 0000 000a 6269 7473 7472 5f6c 6974
2173100 000f 3f41 28c4 0010 0010 df04 239c 0000 0010 def4 ffff ffff 0300 54e7 0000 3287 0000 000c 0010 e5e0 0010 e5e0 0001 0062
2173160 0000 0000 2954 0010 0002 438a 239c 0000 0010 df24 ffff ffff 0300 54ef 0000 3287 0000 000c 0010 e7ac 0010 e7ac 0001 0062
2173240 0000 0000 0000 6307 b328 0010 0012 79fc 0000 0000 ffff ffff 0300 2537 0000 3287 0000 000c 0010 e008 0010 e008 0001 0062
2173320 0000 0000 0008 e3ec 0400 229f 0000 3287 0000 0010 c010 8f74 0010 8f74 0001 0062 0000 0000 000f 5320 0300 4b9f 0000 3287
2173400 0000 000c 0010 e27c 0010 e2a0 0001 0062 0000 0000 0008 c58c 0200 54f7 0000 3287 0000 0008 0011 bc00 0011 6784 0001 0064
2173460 0000 0000 2cac 3fdc 0002 438a 2ca0 1c94 0000 0000 0000 0001 0010 8cfc 0010 8e14 0002 438a 0010 db20 0500 54cf 29c8 1b9c
```

```
2173540  000f 5304 0010 810c 2c78 0010 0002 438a 239c 0000 0012 3a80 2c78 0020 0002 438a 45b8 329c 24d0 0000 0010 e038 0014 3d30
2173620  2420 0000 0008 cefc 0008 c66c 0300 253f 0000 3287 0000 000c 0010 e0a0 0010 e0a0 0001 0062 0000 0000 2c78 0010 0002 438a
2173700  239c 0000 0011 14d8 2c78 0028 0002 438a 56f8 671c 682c 4768 33bc 247c 0010 d724 0018 2ecc 386c 3d30 2420 0000 0010 e090
2173760  ffff ffff 0300 54ff 0000 3287 0000 000c 0010 e100 0010 e100 0001 0062 0000 0000 2cac 90dc 0002 438a 2ca0 3fae 0000 0000
2174040  0000 0000 0010 e058 0010 e059 0010 e062 0010 e0c4 0000 0000 000b 7761 726e 696e 675f 6e79 6900 0000 27f0 0028 0010 8f00
2174120  56f8 671c 682c 4768 33bc 247c 0010 d724 0018 2ecc 386c 3d30 2420 0000 0010 e090 2cac 0099 0002 438a 2ca0 e0d8 0000 0000
2174200  0000 0001 0010 e0d8 0010 e128 000e 839c 0010 e124 0010 e134 2954 0016 0002 438a 4e1c 0000 0000 0007 3574 48c0 7220 0000
2174260  0009 6f75 7470 7574 5f6f 6600 0012 a894 0008 c5ac 0300 5507 0000 3287 0000 000c 0010 e1c0 0010 e1c0 0001 0062 0000 0000
2174340  0008 c5cc 0100 550f 0000 3287 0000 0004 000a 18f0 000a 18f0 0000 0000 0000 0000 0008 696e 7075 745f 6f66 00a8 0013 3848
2174420  0010 e080 0400 54ff 0000 3287 0000 0010 0010 e22c 0010 e22c 0001 0062 0000 0000 2cac 0000 0002 438a 2ca0 0000 0000 0000
2174500  0000 0000 0010 8ff8 0010 9028 0010 e214 0010 e1e4 0000 0000 0008 c5ec 0000 5517 0000 3287 0000 0000 0010 f050 0010 f050
2174560  0001 0062 0000 0000 2b24 0000 0002 438a 0010 9032 29c8 0000 0010 e208 0010 9002 27f0 000c 0011 3074 48b0 7220 2cac 0000
2174640  0002 438a 2ca0 0000 0000 0000 0000 0001 0010 90a8 0010 912c 0010 e260 0010 e250 0010 9138 2b24 0000 0002 438a 0010 90e6
2174720  29c8 0000 0010 e254 0010 90b2 000d 7361 6d65 5f70 726f 6362 6f64 7900 27f0 0024 0010 e2a0 5758 4af8 0000 022b 55f0 4af8
2175000  0000 015b 6750 3050 239c 0000 0010 df54 2954 0024 0002 438a 5758 4af8 0000 022b 55f0 4af8 0000 016b 6750 3050 239c 0000
2175060  0010 df54 0009 6261 7365 645f 696e 7400 0008 7072 6563 6564 6573 0038 0013 7944 ffff ffff 0300 551f 0000 3287 0000 000c
2175140  0010 e380 0010 e380 0001 0062 0000 0000 0008 c62c 0300 5527 0000 3287 0000 000c 0010 e3ac 0010 e3ac 0001 0062 0000 0000
2175220  2cac 0000 0002 438a 2ca0 0000 0000 000c 0000 0003 0010 91dc 0010 9364 0002 438a 0010 e360 2b24 91e8 0002 438a 0010 9304
2175300  0400 54d7 29c8 0000 0010 e344 0010 9280 0000 0000 0000 0000 000c 08f5 0000 0000 000b 6174 6f6d 5f63 6861 7273 3100 0000
2175360  2c78 0010 0002 438a 239c 0000 0010 df54 0009 6261 7365 645f 6e75 6d00 29c8 e374 0010 e4d8 000b 78fe 0013 7a44 2c78 0020
2175440  0002 438a 45b8 329c 24d0 0000 0010 e3dc 0014 3d30 2420 0000 0008 cefc 0008 c64c 0300 552f 0000 3287 0000 000c 0010 e480
2175520  0010 e480 0001 0062 0000 0000 0009 6578 745f 6469 6769 7400 000a 6578 745f 6469 6769 7473 0000 0000 000c 7665 7269 6679
2175600  5f6e 616d 6573 0000 2c78 0028 0002 438a 56f8 671c 682c 4768 33bc 247c 0010 e450 0018 2ecc 386c 3d30 2420 0000 0010 e470
2175660  0010 df44 0300 5537 0000 3287 0000 000c 0010 e4b8 0010 e4c8 0001 0062 0000 0000 0010 e028 0300 553f 0000 3287 0000 000c
2175740  0010 e510 0010 e510 0001 0062 0000 0000 2cac 0000 0002 438a 2ca0 0000 0000 0000 0000 0000 0010 e418 0010 e418 0010 e422
2176020  0010 e4a4 0000 0000 000b 7369 6d70 6c65 5f6e 616d 6500 0000 27f0 0010 0010 e4c8 239c 0000 0010 d724 2954 0010 0002 438a
2176100  239c 0000 0010 d6ac 2b24 e3a0 0002 438a 000b 7946 0013 7abc 27f0 0028 0010 8b4c 56f8 671c 682c 4768 33bc 247c 0010 e450
2176160  0018 2ecc 386c 3130 2420 0000 0010 e470 2cac 0000 0002 438a 2ca0 0000 0000 0000 0000 0001 0010 e4e8 0010 e544 0010 e538
2176240  0010 e534 0010 e550 29c8 0000 0010 8b88 0010 e4f2 2954 0016 0002 438a 4e1c 0000 0000 0007 3574 48c0 7220 0000 2c78 0010
2176320  0002 438a 239c 0000 0012 0fc4 2cac 0000 0002 438a 2ca0 0000 0000 0000 0000 0001 0010 95d0 0010 95d0 0002 438a 0010 e590
2176400  0010 95dc 000b 6263 745f 7374 725f 6c69 7400 0000 0009 6261 7365 5f73 7065 6300 000a 6964 656e 7469 6669 6572 0000 0000
2176460  ffff ffff 0300 554f 0000 3287 0000 000c 0010 e63c 0010 e63c 0001 0062 0000 0000 2cac 0000 0002 438a 2ca0 0000 0000 0000
2176540  0000 0001 0010 9668 0010 9668 0002 438a 0010 e604 0010 9674 0001 6200 b464 836c 0013 f008 0000 0000 000b 78c8 27f0 0020
2176620  0010 e664 4e1c 0000 0000 5557 3574 56f8 4b8c 0000 0000 0213 6bc8 7220 2cac 0000 0002 438a 2ca0 0000 0000 000c 0000 0003
2176700  0010 e61c 0010 e730 0002 438a 0010 e720 0001 7800 28c4 0020 0010 e6a4 4e1c 0000 0000 5557 3574 56f8 4b8c 0000 0000 0313
2176760  6bc8 7220 2b24 0000 0002 438a 0010 e674 0000 5557 29c8 0000 0010 e684 0010 e62c 0001 6f00 28c4 0020 0010 e6c4 4e1c 0000
2177040  0000 555f 3574 56f8 4b8c 0000 0000 027b 6bc8 7220 28c4 0020 0010 e700 4e1c 0000 0000 555f 3574 56f8 4b8c 0000 0000 037b
2177120  6bc8 7220 2b24 0000 0002 438a 0010 e6d4 0000 555f 29c8 0000 0010 e6e4 0010 e6b4 28c4 0020 0010 e730 4e1c 0000 0000 5567
2177200  3574 56f8 4b8c 0000 0000 02c3 6bc8 7220 0010 e75c 0000 0000 0010 e690 0010 e6f0 2954 0020 0002 438a 4e1c 0000 0000 5567
2177260  3574 56f8 4b8c 0000 0000 03c3 6bc8 7220 2b24 0000 0002 438a 0010 e740 0000 5567 29c8 0000 0010 e750 0010 e710 000d 6772
2177340  6170 6869 635f 6368 6172 7300 000b 696f 5f6c 6973 745f 6175 7800 0000 ffff ffff 0300 556f 0000 3287 0000 000c 0010 e7f8
2177420  0010 e7f8 0001 0062 0000 0000 2cac 0000 0002 438a 2ca0 0000 0000 0000 0000 0001 0010 9738 0010 9738 0002 438a 0010 e7d0
2177500  0010 9744 000e 6772 6170 685f 6368 6172 6c69 7374 0000 0000 2c78 0010 0002 438a 239c 0000 0012 0fe4 2c78 0020 0002 438a
2177560  45b8 329c 24d0 0000 0010 e828 0014 3d30 2420 0000 0008 cefc ffff ffff 0300 5577 0000 3287 0000 000c 0010 e8fc 0010 e8fc
2177640  0001 0062 0000 0000 0010 6772 6170 6869 635f 6368 6172 6c69 7374 0000 ffff ffff 0300 557f 0000 3287 0000 000c 0010 e894
2177720  0010 e894 0001 0062 0000 0000 000b 6163 7475 616c 5f70 6172 7400 0000 2c78 0016 0002 438a 4e1c 0000 0000 0007 3574 48c0
2200000  7220 0000 2cac 0000 0002 438a 2ca0 0000 0000 0000 0000 0001 0010 e87c 0010 e87c 0002 438a 0010 e8b8 0010 e888 000b 6772
2200060  6170 685f 6368 6172 7300 0000 2c78 0010 0002 438a 239c 0000 0011 14b8 ffff ffff 0300 5587 0000 3287 0000 000c 0010 e94c
2200140  0010 e94c 0001 0062 0000 0000 2cac 0000 0002 438a 2ca0 0000 0000 0000 0000 0000 0010 982c 0010 9868 0010 e930 0010 e920
2200220  0000 0000 2b24 0000 0002 438a 0010 9872 29c8 0000 0010 e924 0010 9836 0007 696f 5f6c 6973 7400 b518 0013 7b14 2cac 0000
2200300  0002 438a 2ca0 0000 0000 0000 0000 0001 0010 98d4 0010 e98c 0010 e980 0010 e970 0010 e998 2b24 0000 0002 438a 0010 991a
2200360  29c8 0000 0010 e974 0010 98de 2954 0016 0002 438a 4e1c 0000 0000 0007 3574 48c0 7220 0000 2c78 0010 0002 438a 239c 0000
2200440  0011 140c 27f0 0010 0010 e9c4 239c 0000 0010 d6ac 28c4 0010 0010 e9e4 239c 0000 0010 d724 000c 7370 6563 6961 6c5f 6368
2200520  6172 0000 28c4 0010 0010 ea14 239c 0000 0010 ea04 ffff ffff 0300 558f 0000 3287 0000 000c 0010 eb2c 0010 ed90 0001 0062
2200600  0000 0000 28c4 0010 0010 ea44 239c 0000 0010 ea34 0010 d8ec 0300 548f 0000 3287 0000 000c 0010 eac8 0010 eac8 0001 0062
```

```
2200660 0000 0000 28c4 0010 0010 ea8c 239c 0000 0010 ea64 0010 d930 0300 5497 0000 3287 0000 000c 0010 eaf8 0010 eaf8 0001 0062
2200740 0000 0000 0012 6f74 6865 725f 7370 6563 6961 6c5f 6368 6172 0000 0000 2954 0010 0002 438a 239c 0000 0010 eaac ffff ffff
2201020 0300 5597 0000 3287 0000 000c 0010 edc4 0010 ef74 0001 0062 0000 0000 0007 6675 6e63 616c 6c00 0000 2c78 0024 0002 438a
2201100 3690 3574 56f8 6c08 6bc8 4538 6c08 5370 56f8 4af8 0000 0103 5370 7220 0006 6661 6374 6f72 0000 0000 2c78 0024 0002 438a
2201160 3690 3574 56f8 6c08 6bc8 4538 6c08 5370 56f8 4af8 0000 004b 5370 7220 0000 5217 b328 0000 0010 b39c 0000 0000 27f0 0024
2201240 0010 eb50 3690 3574 56f8 6c08 6bc8 4538 6c08 5370 56f8 4af8 0000 011b 5370 7220 28c4 0024 0010 eb74 3690 3574 56f8 6c08
2201320 6bc8 4538 6c08 5370 56f8 4af8 0000 0133 5370 7220 28c4 0024 0010 eb98 3690 3574 56f8 6c08 6bc8 4538 6c08 5370 56f8 4af8
2201400 0000 013b 5370 7220 28c4 0024 0010 ebbc 3690 3574 56f8 6c08 6bc8 4538 6c08 5370 56f8 4af8 0000 0143 5370 7220 28c4 0024
2201460 0010 ebe0 3690 3574 56f8 6c08 6bc8 4538 6c08 5370 56f8 4af8 0000 014b 5370 7220 28c4 0024 0010 ec04 3690 3574 56f8 6c08
2201540 6bc8 4538 6c08 5370 56f8 4af8 0000 0153 5370 7220 28c4 0024 0010 ec28 3690 3574 56f8 6c08 6bc8 4538 6c08 5370 56f8 4af8
2201620 0000 015b 5370 7220 28c4 0024 0010 ec4c 3690 3574 56f8 6c08 6bc8 4538 6c08 5370 56f8 4af8 0000 0163 5370 7220 28c4 0024
2201700 0010 ec70 3690 3574 56f8 6c08 6bc8 4538 6c08 5370 56f8 4af8 0000 016b 5370 7220 28c4 0024 0010 ec94 3690 3574 56f8 6c08
2201760 6bc8 4538 6c08 5370 56f8 4af8 0000 03eb 5370 7220 28c4 0024 0010 ecb8 3690 3574 56f8 6c08 6bc8 4538 6c08 5370 56f8 4af8
2202040 0000 017b 5370 7220 28c4 0024 0010 ecdc 3690 3574 56f8 6c08 6bc8 4538 6c08 5370 56f8 4af8 0000 01d3 5370 7220 28c4 0024
2202120 0010 ed00 3690 3574 56f8 6c08 6bc8 4538 6c08 5370 56f8 4af8 0000 01db 5370 7220 28c4 0024 0010 ed24 3690 3574 56f8 6c08
2202200 6bc8 4538 6c08 5370 56f8 4af8 0000 01e3 5370 7220 28c4 0024 0010 ed48 3690 3574 56f8 6c08 6bc8 4538 6c08 5370 56f8 4af8
2202260 0000 01eb 5370 7220 28c4 0024 0010 ed6c 3690 3574 56f8 6c08 6bc8 4538 6c08 5370 56f8 4af8 0000 01f3 5370 7220 28c4 0024
2202340 0010 ed90 3690 3574 56f8 6c08 6bc8 4538 6c08 5370 56f8 4af8 0000 02fb 5370 7220 2954 0024 0002 438a 3690 3574 56f8 6c08
2202420 6bc8 4538 6c08 5370 56f8 4af8 0000 03e3 5370 7220 2aa8 4cd0 000d 4ccc 0013 5b56 0013 7bc8 27f0 0024 0010 ede8 3690 3574
2202500 56f8 6c08 6bc8 4538 6c08 5370 56f8 4af8 0000 010b 5370 7220 28c4 0024 0010 ee0c 3690 3574 56f8 6c08 6bc8 4538 6c08 5370
2202560 56f8 4af8 0000 0123 5370 7220 28c4 0024 0010 ee30 3690 3574 56f8 6c08 6bc8 4538 6c08 5370 56f8 4af8 0000 012b 5370 7220
2202640 28c4 0024 0010 ee54 3690 3574 56f8 6c08 6bc8 4538 6c08 5370 56f8 4af8 0000 0203 5370 7220 28c4 0024 0010 ee78 3690 3574
2202720 56f8 6c08 6bc8 4538 6c08 5370 56f8 4af8 0000 01fb 5370 7220 28c4 0024 0010 ee9c 3690 3574 56f8 6c08 6bc8 4538 6c08 5370
2203000 56f8 4af8 0000 02db 5370 7220 28c4 0024 0010 eec0 3690 3574 56f8 6c08 6bc8 4538 6c08 5370 56f8 4af8 0000 02eb 5370 7220
2203060 28c4 0024 0010 eee4 3690 3574 56f8 6c08 6bc8 4538 6c08 5370 56f8 4af8 0000 02e3 5370 7220 28c4 0024 0010 ef08 3690 3574
2203140 56f8 6c08 6bc8 4538 6c08 5370 56f8 4af8 0000 02f3 5370 7220 28c4 0024 0010 ef2c 3690 3574 56f8 6c08 6bc8 4538 6c08 5370
2203220 56f8 4af8 0000 0303 5370 7220 28c4 0024 0010 ef50 3690 3574 56f8 6c08 6bc8 4538 6c08 5370 56f8 4af8 0000 03db 5370 7220
2203300 28c4 0024 0010 ef74 3690 3574 56f8 6c08 6bc8 4538 6c08 5370 56f8 4af8 0000 03eb 5370 7220 2954 0024 0002 438a 3690 3574
2203360 56f8 6c08 6bc8 4538 6c08 5370 56f8 4af8 0000 03f3 5370 7220 000b 656e 7469 7479 5f74 7970 6500 0000 2c78 0014 0002 438a
2203440 56f8 4af8 ffff fffb 6b88 7220 2cac 0000 0002 438a 2ca0 0000 0000 0000 0000 0000 0010 efa8 0010 efa8 0010 efb2 0010 efe0
2203520 0000 0000 0012 496c 6c65 6761 6c20 6368 6172 6163 7465 7220 0000 0000 000f 2066 6f75 6e64 2069 6e20 6c69 6e65 2000 0000
2203600 ffff ffff 0100 559f 0000 3287 0000 0004 0010 9acc 0010 9acc 0001 0062 0000 0000 0000 5217 b328 0000 0010 b360 0000 0000
2203660 000d 6261 7365 645f 6c69 7465 7261 6c00 2c78 0018 0002 438a 4240 0000 0000 55b7 239c 0000 0008 ec1c 0007 7072 6f63 616c
2203740 6c00 9b2c 000f 6465 6369 6d61 6c5f 6c69 7465 7261 6c00 0000 0009 7061 7261 6d65 7465 7200 0011 6163 7475 616c 5f64 6573
2204020 6967 6e61 746f 7200 0000 0000 27f0 000c 0011 5670 48b0 7220 27f0 000c 0011 55a8 48b0 7220 29c8 f0bc 0010 f0d0 0011 51d2
2204100 2b24 f0c8 0002 438a 000f dde2 29c8 f0d4 0010 f0e8 0011 4d42 2b24 f0e0 0002 438a 0010 148a 27f0 000c 0010 0430 48b0 7220
2204160 29c8 f0f8 0010 f10c 0011 44ee 2b24 f104 0002 438a 0010 0336 27f0 000c 0010 02b4 48b0 7220 0007 6964 5f6c 6973 7400 f130
2204240 27f0 000c 0011 43f0 48b0 7220 0009 7668 646c 5f6d 6f64 6500 0007 7072 696d 6172 7900 f154 0006 6c65 7474 6572 0010 f160
2204320 29c8 f158 0010 f16c 0011 3d6e 2b24 f154 0002 438a 0010 388a 0008 7265 6c61 7469 6f6e 0084 27f0 000c 0010 822c 48b0 7220
2204400 27f0 000c 0011 3940 48b0 7220 0009 6469 7265 6374 696f 6e00 27f0 000c 0011 2ed4 48b0 7220 27f0 000c 0011 2e3c 48b0 7220
2204460 27f0 000c 0010 5a34 48b0 7220 0008 7761 7665 666f 726d 00d8 0007 6f70 7469 6f6e 7300 f1e4 0006 7461 7267 6574 0010 f1f0
2204540 27f0 000c 0011 2b20 48b0 7220 0006 6368 6f69 6365 0010 f208 27f0 000c 0011 2608 48b0 7220 0007 6368 6f69 6365 7300 f220
2204620 27f0 000c 0011 24a4 48b0 7220 27f0 000c 0011 22fc 48b0 7220 0009 6269 745f 7661 6c75 6500 0008 6578 706f 6e65 6e74 0050
2204700 0006 7072 6566 6978 0010 f25c 0009 7479 7065 5f6d 6172 6b00 29c8 f260 0010 f274 0011 1a0e 2b24 f26c 0002 438a 0010 bbbe
2204760 0009 636f 6e64 6974 696f 6e00 27f0 000c 0011 1818 48b0 7220 27f0 000c 0011 17c0 48b0 7220 0009 616c 6c6f 6361 746f 7200
2205040 0009 6167 6772 6567 6174 6500 0009 7668 646c 5f6e 616d 6500 0009 6170 6172 7479 2e70 6c00 0006 6c65 782e 706c 0010 f2e0
2205120 0010 f400 0000 002c b288 b66c 0000 0996 7fff ffff 0011 7518 0200 0db5 0100 15ad 0100 33fd 0000 000b 0000 315f 003b 2f68
2205200 6f6d 652f 6f73 6173 312f 612f 7669 6a61 792f 5648 444c 2f70 6172 7365 722f 7072 6f6c 6f67 2f6e 6577 6e65 772f 7633 2e31
2205260 2f63 6f75 6e74 6572 7300 6d61 003e 2f68 6f6d 652f 6f73 6173 312f 612f 7669 6a61 792f 5648 444c 2f70 6172 7365 722f 7072
2205340 6f6c 6f67 2f6e 6577 6e65 772f 7633 2e31 2f63 6f75 6e74 6572 732e 706c 005b 5d20 0000 002c 0011 76d0 b27c b66c 0000 0999
2205420 7fff ffff 0010 b35c 0200 0db5 0200 2f35 0000 5eb7 0000 0323 0000 315f 0000 002c 000d 84b0 b27c b66c 0000 09a2 7fff ffff
2205500 0010 b388 0200 0db5 0200 224d 0000 5eb7 0000 3287 0000 315f 2954 0014 0002 438a 5d10 0000 0100 53c7 5fa0 228c 0010 f4d0
2205560 0000 0090 b27c b66c 0000 099b 0000 09a1 000a d16d 0200 0db5 0200 270d 0000 5eb7 0000 3287 0000 315f 0010 f464 0000 0038
2205640 b27c b66c 0000 099c 0000 09a3 0010 f4d4 0200 0db5 0500 1cdd 0000 53f7 0000 000b 0000 3287 0086 9c63 0000 0323 0000 315f
2205720 0010 f4d0 0000 002c b4f0 b4e4 0000 099b 7fff ffff 0008 b0dd 0000 0000 0000 0000 0010 f5c4 0002 438a 0011 b564 0000 0000
```

```
2206000 000c 0000 0000 0000 0000 0000 0000 0000 0000 0000 000b 8919 0010 9be9 000d a70d 0011 b634 0011 b654 0011 b674 000a e3c9
2206060 0011 b714 000a ddd1 0011 b6f4 0010 f548 0000 0038 b27c b66c 0000 099d 0000 09a4 0010 f54c 0200 0db5 0500 1cdd 0000 5eff
2206140 0000 0013 0000 3287 008d bb83 0000 0323 0000 315f 0000 0000 0000 0000 0000 0000 0000 0000 0000 0000 0000 000a dbcd
2206220 000b 4115 000a e041 0011 b890 0011 b8b0 0011 b8d0 000b 1ead 0011 b970 000a 3851 0011 b950 0010 f5c0 0000 0038 b27c b66c
2206300 0000 099e 0000 09a5 0010 f5c4 0200 0db5 0500 1cdd 0000 54a7 0000 000b 0000 3287 0086 d463 0000 0323 0000 315f 0000 0000
2206360 0000 000c 0000 0000 000c 0000 0000 0000 0000 0000 000a da7d 000a 354d 000a 331d 0011 bab4 0011 bad4 0011 baf4 000d a73d
2206440 0011 bb94 000a 332d 0011 bb74 0010 f638 0000 0038 b130 b66c 0000 099f 0000 09a6 0010 f469 0200 0db5 0500 1cdd 0000 54f7
2206520 0000 0013 0000 3287 0096 fda3 0000 0323 0000 315f 0000 0000 0000 0000 0000 0000 0000 0000 0000 0000 0000 000a 32d1
2206600 000d a76d 000d a745 0011 bcf0 0011 bd10 0011 bd30 000b 66e1 0011 bdd0 0010 b78d 0011 bdb0 0011 4764 0000 1cb4 6172 742c
2206660 0a09 5b62 6567 696e 5d2c 0a09 7375 6270 726f 6772 616d 5f73 7461 7465 6d65 6e74 5f70 6172 742c 0a09 5b65 6e64 5d2c 2028
2206740 5b5d 207c 2064 6573 6967 6e61 746f 7228 4429 2c20 7b76 6572 6966 795f 6e61 6d65 7328 5375 6250 726f 674e 616d 652c 2044
2207020 297d 292e 0a20 2020 200a 7375 6270 726f 6772 616d 5f64 6563 6c61 7261 7469 6f6e 202d 2d3e 0a09 7375 6270 726f 6772 616d
2207100 5f73 7065 6369 6669 6361 7469 6f6e 285f 5375 6250 726f 674e 616d 6529 2e0a 0a73 7562 7072 6f67 7261 6d5f 6465 636c 6172
2207160 6174 6976 655f 6974 656d 202d 2d3e 0a09 7375 6270 726f 6772 616d 5f64 6563 6c61 7261 7469 6f6e 0a20 2020 2020 207c 2073
2207240 7562 7072 6f67 7261 6d5f 626f 6479 0a20 2020 2020 207c 2074 7970 655f 6465 636c 6172 6174 696f 6e0a 2020 2020 2020 7c20
2207320 7375 6274 7970 655f 6465 636c 6172 6174 696f 6e0a 2020 2020 2020 7c20 636f 6e73 7461 6e74 5f64 6563 6c61 7261 7469 6f6e
2207400 0a20 2020 2020 207c 2076 6172 6961 626c 555f 6465 636c 6172 6174 696f 6e0a 2020 2020 2020 7c20 6669 6c65 5f64 6563 6c61
2207460 7261 7469 6f6e 0a20 2020 2020 207c 2061 6c69 6173 5f64 6563 6c61 7261 7469 6f6e 0a20 2020 2020 207c 2061 7474 7269 6275
2207540 7465 5f64 6563 6c61 7261 7469 6f6e 0a20 2020 2020 207c 2061 7474 7269 6275 7465 5f73 7065 6369 6669 6361 7469 6f6e 0a20
2207620 2020 2020 207c 2075 7365 5f63 6c61 7573 652e 0a0a 7375 6270 726f 6772 616d 5f64 6563 6c61 7261 7469 7665 5f70 6172 7420
2207700 2d2d 3e20 5b5d 2e0a 7375 6270 726f 6772 616d 5f64 6563 6c61 7261 7469 7665 5f70 6172 7420 2d2d 3e0a 0973 7562 7072 6f67
2207760 7261 6d5f 6465 636c 6172 6174 6976 655f 6974 656d 2c20 7375 6270 726f 6772 616d 5f64 6563 6c61 7261 7469 7665 5f70 6172
2210040 742e 0a0a 7375 6270 726f 6772 616d 5f73 7065 6369 6669 6361 7469 6f6e 2853 7562 5072 6f67 4e61 6d65 2920 2d2d 3e0a 095b
2210120 7072 6f63 6564 7572 655d 2c20 6465 7369 676e 6174 6f72 2853 7562 5072 6f67 4e61 6d65 292c 0a09 2020 2020 2020 2020 2020
2210200 2020 285b 5d20 7c20 5b27 2827 5d2c 666f 726d 616c 5f70 6172 6161 6574 6572 5f6c 6973 742c 5b27 2927 5d29 0a20 2020 2020
2210260 207c 205b 6675 6e63 7469 6f6e 5d2c 2064 6573 6967 6e61 746f 7228 5375 6250 726f 674e 616d 6529 2c0a 0920 2020 2020 2020
2210340 2020 2020 2028 5b5d 207c 235b 2728 275d 2c66 6f72 6d61 6c5f 7061 7261 6d65 7465 725f 6c69 7374 2c5b 2729 275d 292c 0a09
2210420 5b72 6574 7572 6e5d 2c20 7479 7065 5f6d 6172 6b28 5f54 7970 6529 2e0a 0a73 7562 7072 6f67 7261 6d5f 7374 6174 656d 656e
2210500 745f 7061 7274 202d 2d3e 205b 5d2e 0a73 7562 7072 6f67 7261 6d5f 7374 6174 656d 656e 745f 7061 7274 202d 2d3e 0a09 7365
2210560 7175 656e 7469 616c 5f73 7461 7465 6d65 6e74 2c20 7375 6270 726f 6772 616d 5f73 7461 7465 6d65 6e74 5f70 6172 742e 0a0a
2210640 7375 6274 7970 655f 6465 636c 6172 6174 696f 6e20 2d2d 3e0a 095b 7375 6274 7970 655d 2c20 6964 656e 7469 6669 6572 285f
2210720 4964 292c 205b 6973 5d2c 2073 7562 7479 7065 5f69 6e64 6963 6174 696f 6e28 5f53 7562 5479 7065 292c 205b 273b 275d 2e0a
2211000 090a 2520 5468 6973 2069 7320 686f 7720 6974 2773 2064 6566 696e 6564 2020 696e 2074 6865 206d 616e 7561 6c2e 200a 2520
2211060 7375 6274 7970 655f 696e 6469 6361 7469 6f6e 2853 7562 5479 7065 2920 2d2d 3e0a 2509 285b 5d20 7c20 2f2a 7265 736f 6c75
2211140 7469 6f6e 5f66 756e 6374 696f 6e5f 2a2f 7668 646c 5f6e 616d 6528 4e61 6d65 2929 2c20 7479 7065 5f6d 6172 6b28 5f54 7970
2211220 6529 2c0a 2520 2020 2020 2020 285b 5d20 7c20 636f 6e73 7472 6169 6e74 292e 0a25 0a25 2054 6865 2063 6c61 7573 6520 6861
2211300 7320 6265 656e 2072 6577 7269 7474 656e 0a25 2069 6e20 6f72 6465 7220 746f 2065 7863 6c75 6465 2063 6572 7461 696e 2063
2211360 6f6e 7374 7275 6374 7320 7468 6174 2068 6176 6520 6e6f 7420 7965 7420 6265 656e 2069 6d70 6c65 6d65 6e74 6564 2e0a 250a
2211440 7375 6274 7970 655f 696e 6469 6361 7469 6f6e 2853 7562 5479 7065 2920 2d2d 3e0a 0976 6864 6c5f 6e61 6d65 2853 7562 5479
2211520 7065 292c 2076 6864 6c5f 6e61 6165 2853 7562 5479 7065 292c 2063 6f6e 7374 7261 696e 742c 0a09 7b77 6172 6e69 6e67 5f6e
2211600 7969 2822 7375 6274 7970 655f 696e 6469 6361 7469 6f6e 2077 6974 6820 7477 6f20 6e61 6d65 7320 616e 6420 6120 636f 6e73
2211660 7472 6169 6e74 2229 7d2e 0a73 7562 7479 7065 5f69 6e64 6963 6174 696f 6e28 5375 6254 7970 6529 202d 2d3e 0a09 7668 646c
2211740 5f6e 616d 6528 5375 6254 7970 6529 2c20 7668 646c 5f6e 616d 6528 5375 6254 7970 6529 2c20 0a09 7b77 6172 6e69 6e67 5f6e
2212020 7969 2822 7375 6274 7970 655f 696e 6469 6361 7469 6f6e 2077 6974 6820 7477 6f20 6e61 6d65 7322 297d 2e0a 7375 6274 7970
2212100 655f 696e 6469 6361 7469 6f6e 2853 7562 5479 7065 2920 2d2d 3e0a 0976 6864 6c5f 6e61 6d65 2853 7562 5479 7065 292c 2063
2212160 6f6e 7374 7261 696e 742e 0a73 7562 7479 7065 5f69 6e64 6963 6174 696f 6e28 5375 6254 7970 6529 202d 2d3e 0a09 7668 646c
2212240 5f6e 616d 6528 5375 6254 7970 6529 2e0a 0a73 7566 6669 7828 5329 202d 2d3e 0a09 7369 6d70 6c65 5f6e 616d 6528 5329 0a20
2212320 2020 2020 207c 2063 6861 7261 6374 6572 5f6c 6974 6572 616c 2853 290a 2020 2020 2020 7c20 6f70 6572 6174 6f72 5f73 796d
2212400 626f 6c28 5329 0a20 2020 2020 207c 205b 616c 6c5d 2c7b 533d 616c 6c7d 2e0a 0a74 6172 6765 7428 5429 202d 2d3e 0909 0909
2212460 0925 204e 6f74 6520 6d6f 6469 6669 6361 7469 6f6e 2068 6572 6520 210a 0976 6864 6c5f 6e61 6d65 2854 290a 2520 2020 2020
2212540 207c 2061 6767 7265 6761 7465 2854 290a 2020 2020 2020 2e0a 0a74 6572 6d28 5465 726d 2920 2d2d 3e0a 0966 6163 746f 7228
2212620 5465 726d 292e 0a74 6572 6d28 5465 726d 2920 2d2d 3e0a 0966 6163 746f 7228 4629 2c20 6d75 6c74 6970 6c79 696e 675f 6f70
2212700 6572 6174 6f72 284d 4f70 292c 2074 6572 6d28 5429 2c0a 097b 5465 726d 203d 2065 7870 7228 4d4f 702c 2046 2c20 5429 7d2e
2212760 0a0a 7469 6d65 6f75 745f 636c 6175 7365 202d 2d3e 0a09 5b66 6f72 5d2c 202f 2a74 696d 655f 2a2f 6578 7072 6573 7369 6f6e
2213040 2e0a 0a74 7970 655f 636f 6e76 6572 7369 6f6e 202d 2d3e 0a09 7479 7065 5f6d 6172 6b28 5f54 7970 6529 2c20 5b27 2827 5d2c
```

```
2213120 2065 7870 7265 7373 696f 6e28 5f45 7870 7229 2c20 5b27 2927 5d2e 0a0a 7479 7065 5f64 6563 6c61 7261 7469 6f6e 202d 2d3e
2213200 0a09 6675 6c6c 5f74 7970 655f 6465 636c 6172 6174 696f 6e0a 2020 2020 2020 7c20 696e 636f 6d70 6c65 7465 5f74 7970 655f
2213260 6465 636c 6172 6174 696f 6e2e 0a0a 7479 7065 5f64 6566 696e 6974 696f 6e20 2d2d 3e0a 0973 6361 6c61 725f 7479 7065 5f64
2213340 6566 696e 6974 696f 6e0a 2020 2020 2020 7c20 636f 6d70 6f73 6974 655f 7479 7065 5f64 6566 696e 6974 696f 6e0a 2020 2020
2213420 2020 7c20 6163 6365 7373 5f74 7970 655f 6465 6669 6e69 7469 6f6e 0a20 2020 2020 207c 2066 696c 655f 7479 7065 5f64 6566
2213500 696e 6974 696f 6e2e 0a0a 7479 7065 5f6d 6172 6b28 4e61 6d65 2920 2d2d 3e0a 092f 2a74 7970 655f 2a2f 7668 646c 5f6e 616d
2213560 6528 4e61 6d65 290a 2020 2020 2020 7c20 2f2a 7375 6274 7970 655f 2a2f 7668 646c 5f6e 616d 6528 4e61 6d65 292e 0a0a 756e
2213640 636f 6e73 7472 6169 6e65 645f 6172 7261 795f 6465 6669 6e69 7469 6f6e 202d 2d3e 0a09 5b61 7272 6179 5d2c 205b 2728 275d
2213720 2c20 696e 6465 785f 7375 6274 7970 655f 6465 6669 6e69 7469 6f6e 5f6c 6973 742c 205b 2729 275d 2c20 2520 6164 6465 6420
2214000 746f 2067 7261 610a 095b 6f66 5d2c 202f 2a65 6c65 6165 6e74 5f2a 2f73 7562 7479 7065 5f69 6e64 6963 6174 696f 6e28 5f53
2214060 7562 5479 7065 292e 0a0a 7573 655f 636c 6175 7365 202d 2d3e 0a09 5b75 7365 5d2c 2073 656c 6563 7465 645f 6e61 6d65 5f6c
2214140 6973 742c 205b 273b 275d 2e09 2520 6164 6465 6420 746f 2067 7261 6d61 6172 0a0a 7573 655f 636c 6175 7365 5f6c 6973 7420
2214220 2d2d 3e20 5b5d 2e09 0909 0925 2061 6464 6564 2063 6c61 7573 650a 7573 655f 636c 6175 7365 5f6c 6973 7420 2d2d 3e0a 0975
2214300 7365 5f63 6c61 7573 652c 2075 7365 5f63 6c61 7573 655f 6c69 7374 2e0a 0a76 6172 6961 626c 655f 6173 7369 676e 6d65 6e74
2214360 5f73 7461 7465 6d65 6e74 202d 2d3e 0a09 7461 7267 6574 2854 6172 6765 7429 2c20 285b 3a5d 2c5b 3d5d 207c 205b 3a3d 5d29
2214440 2c20 6578 7072 6573 7369 6f6e 2845 7870 7229 2c20 5b27 3b27 5d2c 0a09 7b70 7574 6462 5f76 6172 6961 626c 655f 6173 7369
2214520 676e 6d65 6e74 2854 6172 6765 742c 2045 7870 7229 7d2e 0a0a 7661 7269 6162 6c65 5f64 6563 6c61 7261 7469 6f6e 202d 2d3e
2214600 0a09 5b76 6172 6961 626c 655d 2c20 6964 656e 7469 6669 6572 5f6c 6973 7428 4944 4c69 7374 292c 205b 3a5d 2c20 7375 6274
2214660 7970 655f 696e 6469 6361 7469 6f6e 2853 7562 5479 7065 292c 0a09 285b 5d20 7c20 285b 3a5d 2c5b 3d5d 207c 205b 3a3d 5d29
2214740 2c20 6578 7072 6573 7369 6f6e 285f 4578 7072 292c 0a09 2020 2020 2020 7b77 6172 6e69 6e67 5f69 676e 2822 7661 7269 6162
2215020 6c65 5f69 5e69 7469 616c 697a 6174 696f 6e22 297d 292c 0a09 5b27 3b27 5d2c 0a09 7b70 7574 6462 5f76 6172 6961 626c 655f
2215100 6465 636c 6172 6174 696f 6e28 4944 4c69 7374 2c20 5375 6254 7970 6529 7d2e 0a0a 7761 6974 5f73 7461 7465 6d65 6e74 202d
2215160 2d3e 0a09 5b77 6169 745d 2c0a 0928 5b5d 207c 2073 656e 7369 7469 7669 7479 5f63 6c61 7573 6529 2c0a 0928 5b5d 207c 2063
2215240 6f6e 6469 7469 6f6e 5f63 6c61 7573 6529 2c0a 0928 5b5d 207c 2074 696d 656f 7574 5f63 6c61 7573 6529 2c20 5b27 3b27 5d2e
2215320 0a0a 7761 7665 666f 726d 2857 2920 2d2d 3e09 0909 0909 2520 4e6f 7465 206d 6f64 6966 6963 6174 696f 6e20 6865 7265 2021
2215400 0a09 7761 7665 666f 726d 5f65 6c65 6d65 6e74 2857 292e 0a25 2054 6865 2066 6f6c 6c6f 7769 6e67 2069 7320 7573 6564 206f
2215460 6e6c 7920 696e 2063 6173 6520 6f66 2074 696d 6520 6578 7072 6573 7369 6f6e 7320 616e 6420 6865 6e63 6520 6e6f 740a 2520
2215540 696d 706c 656d 656e 7465 640a 2577 6176 6566 6f72 6d28 5729 202d 2d3e 0a25 0977 6176 6566 6f72 6d5f 656c 656d 656e 742c
2215620 205b 272c 275d 2c20 7761 7665 666f 726d 2e0a 0a77 6176 6566 6f72 6d5f 656c 656d 656e 7428 5729 202d 2d3e 0a09 2f2a 7661
2215700 6c75 655f 2a2f 6578 7072 6573 7369 6f6e 2857 292e 0a25 2054 6865 2066 6f6c 6c6f 7769 6e67 2068 6173 206e 6f74 2079 6574
2215760 2062 6565 6e20 696d 706c 656d 656e 7465 640a 2577 6176 6566 6f72 6d5f 656c 656d 656e 7420 2d2d 3e0a 2509 2f2a 7661 6c75
2216040 655f 2a2f 6578 7072 6573 7369 6f6e 285f 5645 7870 7229 2c20 5b61 6674 6572 5d2c 202f 2a74 696d 655f 2a2f 6578 7072 6573
2216120 7369 6f6e 285f 5445 7870 7229 2e0a 2577 6176 6566 6f72 6d5f 656c 656d 656e 7420 2d2d 3e0a 2509 5b6e 756c 6c5d 2e0a 2577
2216200 6176 6566 6f72 615f 656c 656d 656e 7420 2d2d 3e0a 2509 5b6e 756c 6c5d 2c20 5b61 6674 6572 5d2c 202f 2a74 696d 655f 2a2f
2216260 6578 7072 6573 7369 6f6e 285f 4578 7072 292e 0a6f 7264 5f74 7970 655f 6465 6669 6e69 7469 6f6e 202d 2d3e 0a09 5b72 6563
2216340 6f72 645d 2c20 656c 656d 656e 745f 6465 636c 6172 6174 696f 6e5f 6c69 7374 2c09 2520 6164 6465 6420 746f 2067 7261 6d6d
2216420 6172 0a09 5b65 6e64 5d2c 205b 7265 636f 7264 5d2e 0a0a 7265 6c61 7469 6f6e 2852 2920 2d2d 3e0a 0973 696d 706c 655f 6578
2216500 7072 6573 7369 6f6e 2852 292e 0a72 656c 6174 696f 6e28 5229 202d 2d3e 0a09 7369 6d70 6c65 5f65 7870 7265 7373 696f 6e28
2216560 4531 292c 2072 656c 6174 696f 6e61 6c5f 6f70 6572 6174 6f72 284f 7029 2c20 7369 6d70 6c65 5f65 7870 7265 7373 696f 6e28
2216640 4532 292c 0a09 7b52 203d 2065 7870 7228 4f70 2c20 4531 2c20 4532 297d 2e0a 0a72 656c 6174 696f 6e61 6c5f 6f70 6572 6174
2216720 6f72 284f 7029 202d 2d3e 0a09 5b3d 5d2c 207b 4f70 203d 2027 3d27 7d20 7c20 285b 2f5d 2c5b 3d5d 207c 205b 2f3d 5d29 2c20
2217000 7b4f 7020 3d20 272f 3d27 7d0a 2020 2020 2020 7c20 5b3c 5d2c 207b 4f70 203d 2027 3c27 7d20 7c20 285b 3c5d 2c5b 3d5d 207c
2217060 205b 3c3d 5d29 2c20 7b4f 7020 3d20 273c 3d27 7d0a 2020 2020 2020 7c20 5b3e 5d2c 207b 4f70 203d 2027 3e27 7d20 7c20 285b
2217140 3e5d 2c5b 3d5d 207c 205b 3e3d 5d29 2c20 7b4f 7020 3d20 273e 3127 7d2e 0a0a 7265 6c61 7469 6f6e 5f61 6e64 5f6c 6973 7428
2217220 6578 7072 2861 6e64 2c20 5231 2c20 5232 2929 202d 2d3e 0925 2061 6464 6564 2063 6c61 7573 650a 0972 656c 6174 696f 6e28
2217300 5231 292c 205b 616e 645d 2c20 7265 6c61 7469 6f6e 2852 3229 2e0a 7265 6c61 7469 6f6e 5f61 6e64 5f6c 6973 7428 6578 7072
2217360 2861 6e64 2c20 5231 2c20 5232 2929 202d 2d3e 0a09 7265 6c61 7469 6f6e 2852 3129 2c20 5b61 6e64 5d2c 2072 656c 6174 696f
2217440 6e5f 616e 645f 6c69 7374 2852 3229 2e0a 0a72 656c 6174 696f 6e5f 6f72 5f6c 6973 7428 6578 7072 286f 722c 2052 312c 2052
2217520 3229 2920 2d2d 3e09 0925 2061 6464 6564 2063 6c61 7573 650a 0972 656c 6174 696f 6e28 5231 292c 205b 6f72 5d2c 2072 656c
2217600 6174 696f 6e28 5232 292e 0a72 656c 6174 696f 6e5f 6f72 5f6c 6973 7428 6578 7072 286f 722c 2052 312c 2052 3229 2920 2d2d
2217660 3e0a 0972 656c 6174 696f 6e28 5231 292c 205b 6f72 5d2c 2072 656c 6174 696f 6e5f 616e 645f 6c69 7374 2852 3229 2e0a 0a72
2217740 656c 6174 696f 6e5f 786f 725f 6c69 7374 2865 7870 7228 786f 722c 2052 312c 2052 3229 2920 2d2d 3e09 0925 2061 6464 6564
2220020 2063 6c61 7573 650a 0972 656c 6174 696f 6e28 5231 292c 205b 786f 725d 2c20 7265 6c61 7469 6f6e 2852 3229 2e0a 7265 6c61
2220100 7469 6f6e 5f78 6f72 5f6c 6973 7428 6578 7072 2878 6f72 2c20 5231 2c20 5232 2929 202d 2d3e 0a09 7265 6c61 7469 6f6e 2852
2220160 3129 2c20 5b78 6f72 5d2c 2072 656c 6174 696f 6e5f 616e 645f 6c69 7374 2852 3229 2e0a 0a72 6574 7572 6e5f 7374 6174 656d
```

2220240 656e 7420 2d2d 3e0a 095b 7265 7475 726e 5d2c 205b 273b 275d 2c20 7b70 7574 6462 5f72 6574 7572 6e5f 7374 6174 656d 656e
2220320 747d 2e0a 7265 7475 726e 5f73 7461 7465 6d65 6e74 202d 2d3e 0a09 5b72 6574 7572 6e5d 2c20 6578 7072 6573 7369 6f6e 2845
2220400 7870 7229 2c20 5b27 3b27 5d2c 207b 7075 7464 625f 7265 7475 726e 5f73 7461 7465 6d65 6e74 2845 7870 7229 7d2e 0a0a 7363
2220460 616c 6172 5f74 7970 655f 6465 6669 6e69 7469 6f6e 202d 2d3e 0a09 656e 756d 6572 6174 696f 6e5f 7479 7065 5f64 6566 696e
2220540 6974 696f 6e0a 2020 2020 2020 7c20 696e 7465 6765 725f 7479 7065 5f64 6566 696e 6974 696f 6e0a 2020 2020 2020 7c20 666c
2220620 6f61 7469 6e67 5f74 7970 655f 6465 6669 6e69 7469 6f6e 0a20 2020 2020 207c 2070 6879 7369 6361 6c5f 7479 7065 5f64 6566
2220700 696e 6974 696f 6e2e 0a0a 7365 636f 6e64 6172 795f 756e 6974 202d 2d3e 0909 0909 2520 4e6f 7465 206d 6f64 6966 6963 6174
2220760 696f 6e20 6865 7265 0a09 6172 6368 6974 6563 7475 7265 5f62 6f64 790a 2520 2020 2020 207c 2070 6163 6b61 6765 5f62 6f64
2221040 790a 2020 2e0a 0a73 6563 6f6e 6461 7279 5f75 6e69 745f 6465 636c 6172 6174 696f 6e20 2d2d 3e0a 0969 6465 6e74 6966 6965
2221120 7228 5f49 6429 2c20 5b3d 5d2c 2070 6879 7369 6361 6c5f 6c69 7465 7261 6c2c 205b 273b 275d 2e0a 0a73 6563 6f6e 6461 7279
2221200 5f75 6e69 745f 6465 636c 6172 6174 696f 6e5f 6c69 7374 202d 2d3e 205b 5d2e 0909 2520 6164 6465 6420 636c 6175 7365 0a73
2221260 6563 6f6e 6461 7279 5f75 6e69 745f 6465 636c 6172 6174 696f 6e5f 6c69 7374 202d 2d3e 0a09 7365 636f 6e64 6172 795f 756e
2221340 6974 5f64 6563 6c61 7261 7469 6f6e 2c20 7365 636f 6e64 6172 795f 756e 6974 5f64 6563 6c61 7261 7469 6f6e 5f6c 6973 742e
2221420 0a0a 2f2a 204e 6f74 6520 7468 6520 6578 636c 7573 696f 6e20 6f66 2073 656c 6563 7465 645f 6e61 6d65 2068 6572 6520 210a
2221500 7365 6c65 6374 6564 5f6e 616d 6528 4e29 202d 2d3e 0a09 7072 6566 6978 2c20 5b27 2e27 5d2c 2073 7566 6669 782e 0a0a 7365
2221560 6c65 6374 6564 5f6e 616d 655f 6c69 7374 202d 2d3e 0909 0909 2520 6164 6465 6420 636c 6175 7365 0a09 7365 6c65 6374 6564
2221640 5f6e 616d 652e 0a73 656c 6563 7465 645f 6e61 6d65 5f6c 6973 7420 2d2d 3e0a 0973 656c 6563 7465 645f 6e61 6d65 2c20 5b27
2221720 2c27 5d2c 2073 656c 6563 7465 645f 6e61 6d65 5f6c 6973 742e 0a2a 2f0a 0a73 656c 6563 7465 645f 7369 676e 616c 5f61 7373
2222000 6967 6e6d 656e 7420 2d2d 3e0a 095b 7769 7468 5d2c 2065 7870 7265 7373 696f 6e28 5f45 7870 7229 2c20 5b73 656c 6563 745d
2222060 2c0a 0974 6172 6765 7428 5f54 292c 2028 5b3c 5d2c 5b3d 5d20 7c20 5b3c 3d5d 292c 206f 7074 696f 6e73 2c20 7365 6c65 6374
2222140 6564 5f77 6176 6566 6f72 6d73 2c20 5b27 3b27 5d2e 0a0a 7365 6c65 6374 6564 5f77 6176 6566 6f72 6d73 202d 2d3e 0909 0909
2222220 2520 6e6f 7420 746f 6f20 7375 7265 2061 626f 7574 2074 6869 730a 0977 6176 6566 6f72 6d2c 205b 7768 656e 5d2c 2063 686f
2222300 6963 6573 2e09 0925 2063 6865 636b 2073 796e 7461 7820 6f6e 2070 6167 6520 412d 3135 0a73 656c 6563 7465 645f 7761 7665
2222360 666f 726d 7320 2d2d 3e0a 0973 656c 6563 7465 645f 7761 7665 666f 726d 732c 205b 272c 275d 2c20 7761 7665 666f 726d 2c20
2222440 5b77 6865 6e5d 2c20 6368 6f69 6365 732e 0a0a 7365 6e73 6974 6976 6974 795f 636c 6175 7365 202d 2d3e 0a09 5b6f 6e5d 2c20
2222520 7365 6e73 6974 6976 6974 795f 6c69 7374 2e0a 0a73 656e 7369 7469 7669 7479 5f6c 6973 7420 2d2d 3e0a 092f 2a73 6967 6e61
2222600 6c5f 2a2f 7668 646c 5f6e 616d 6528 5f4e 616d 6529 2e0a 7365 6e73 6974 6976 6974 795f 6c69 7374 202d 2d3e 0a09 2f2a 7369
2222660 676e 616c 5f2a 2f76 6864 6c5f 6e61 6d65 285f 4e61 6d65 292c 205b 272c 275d 2c20 7365 6e73 6974 6976 6974 795f 6c69 7374
2222740 2e0a 0a73 6571 7565 6e63 655f 6f66 5f73 7461 7465 6d65 6e74 7320 2d2d 3e20 5b5d 2e0a 7365 7175 656e 6365 5f6f 665f 7374
2223020 6174 656d 656e 7473 202d 2d3e 0a09 7365 7175 656e 7469 616c 5f73 7461 7465 6d65 6e74 2c20 7365 7175 656e 6365 5f6f 665f
2223100 7374 6174 656d 656e 7473 2e0a 0a73 6571 7565 6e74 6961 6c5f 7374 6174 656d 656e 7420 2d2d 3e0a 0976 6172 6961 626c 655f
2223160 6173 7369 676e 6165 6e74 5f73 7461 7465 6d65 6e74 2c20 210a 2020 2020 2020 7c20 6966 5f73 7461 7465 6d65 6e74 2c20 210a
2223240 2520 2020 2020 207c 2063 6173 655f 7374 6174 656d 656e 742c 2021 0a20 2020 2020 207c 2070 726f 6365 6475 7265 5f63 616c
2223320 6c5f 7374 6174 656d 656e 742c 2021 0a20 2020 2020 207c 2073 6967 6e61 6c5f 6173 7369 676e 6d65 6e74 5f73 7461 7465 6d65
2223400 6e74 2c20 210a 2020 2020 2020 7c20 6c6f 6f70 5f73 7451 7465 6d65 6e74 2c20 210a 2020 2020 2020 7c20 6e65 7874 5f73 7461
2223460 7465 6d65 6e74 2c20 210a 2020 2020 2020 7c20 7265 7475 726e 5f73 7461 7465 6d65 6e74 2c20 210a 2020 2020 2020 7c20 6e75
2223540 6c6c 5f73 7461 7465 6d65 6e74 2c20 210a 2520 2020 2020 207c 2077 6169 745f 7374 6174 656d 656e 742c 2021 0a25 2020 2020
2223620 2020 7c20 6173 7365 7274 696f 6e5f 7374 6174 656d 656e 742c 2021 0a25 2020 2020 2020 7c20 6578 6974 5f73 7461 7465 6d65
2223700 6e74 2c20 210a 2020 2020 2020 202e 0a0a 7668 646c 5f73 6967 6e20 2d2d 3e0a 095b 2b5d 207c 205b 2d5d 2e0a 0a73 6967 6e61
2223760 6c5f 6173 7369 676e 6d65 6e74 5f73 7461 7465 6d65 6e74 202d 2d3e 0a09 7461 7267 6574 2853 6967 6e61 6c29 2c20 285b 3c5d
2224040 2c5b 3d5d 207c 205b 3c3d 5d29 2c20 7761 7665 666f 726d 2857 6176 6566 6f72 6d29 2c20 5b27 3b27 5d2c 0a09 7b70 7574 6462
2224120 5f73 6967 6e61 6c5f 6173 7369 676e 6d65 6e74 2853 6967 6e61 6c2c 2057 6176 6566 6f72 6d29 7d2e 0a73 6967 6e61 6c5f 6173
2224200 7369 676e 6d65 6e74 5f73 7461 7465 6d65 6e74 202d 2d3e 0a09 7461 7267 6574 285f 5329 2c20 285b 3c5d 2c5b 3d5d 207c 205b
2224260 3c3d 5d29 2c20 5b74 7261 6e73 706f 7274 5d2c 2077 6176 6566 6f72 6d28 5f57 292c 205b 273b 275d 2c0a 097b 7761 726e 696e
2224340 675f 6e79 6928 2273 6967 6e61 6c5f 6173 7369 676e 6d65 6e74 2077 6974 6820 7472 616e 7370 6f72 7420 6465 6c61 7922 297d
2224420 2e0a 0a73 6967 6e61 6c5f 6465 636c 6172 6174 696f 6e20 2d2d 3e0a 095b 7369 676e 616c 5d2c 2069 6465 6e74 6966 6965 725f
2224500 6c69 7374 2849 444c 6973 7429 2c20 5b3a 5d2c 2073 7562 7479 7065 5f69 6e64 6963 6174 696f 6e28 5375 6254 7970 6529 2c0a
2224560 0928 5b5d 2c20 7b53 6967 4b69 6e64 3d75 6e6b 6e6f 776e 7d20 7c20 7369 676e 616c 5f6b 696e 6428 5369 674b 696e 6429 292c
2224640 0a09 285b 5d20 7c20 285b 3a5d 2c5b 3d5d 207c 205b 3a3d 5d29 2c20 6578 7072 6573 7369 6f6e 285f 4578 7072 292c 207b 7761
2224720 726e 696e 675f 6967 6e28 2273 6967 6e61 5c20 696e 6974 6961 6c69 7a61 7469 6f6e 2229 7d29 2c0a 095b 273b 275d 2c0a 097b
2225000 7075 7464 625f 7369 676e 616c 5f64 6563 6c61 7261 7469 6f6e 2849 444c 6973 742c 2053 6967 4b69 6e64 2c20 5375 6254 7970
2225060 6529 7d2e 0a0a 7369 676e 616c 5f6b 696e 6428 5329 202d 2d3e 0a09 5b72 6567 6973 7465 725d 2c7b 533d ffff ffff 0200 55c7
2225140 0000 3287 0000 0008 0011 1308 0011 1308 0001 0063 0000 0000 2c78 0020 0002 438a 45b8 46ec 2ba0 0014 0008 2330 0011 1338
2225220 2c58 2330 0011 1358 ffff ffff 0200 55cf 0000 3287 0000 0008 0010 6148 0010 6148 0001 0063 0000 0000 0008 c6ec 0200 55d7
2225300 0000 3287 0000 0008 0010 bff0 0010 bff0 0001 0063 0000 0000 0016 6163 6365 7373 5f74 7970 655f 6465 6669 6e69 7469 6f6e

```
2225360 0000 0000 0012 7375 6274 7970 655f 696e 6469 6361 7469 6f6e 0000 0000 ffff ffff 0200 55df 0000 3287 0000 0008 0011 13bc
2225440 0011 13bc 0001 0063 0000 0000 2c78 0020 0002 438a 3640 56f8 4b8c 0000 0000 521f 671c 35c8 31f0 22bc 0011 13ec ffff ffff
2225520 0300 55e7 0000 3287 0000 000c 000d c11c 0011 6610 0001 0063 0000 0000 ffff ffff 0300 55ef 0000 3287 0000 000c 0010 b4c0
2225600 0010 b4c0 0001 0063 0000 0000 ffff ffff 0300 55f7 0000 3287 0000 000c 0010 3754 0010 3754 0001 0063 0000 0000 ffff ffff
2225660 0300 55ff 0000 3287 0000 000c 0011 5160 0011 5160 0001 0063 0000 0000 0015 6163 7475 616c 5f70 6172 616d 6574 6572 5f70
2225740 6172 7400 0010 6173 736f 6369 6174 696f 6e5f 6c69 7374 0000 0008 c70c 0300 5607 0000 3287 0000 000c 0010 e8cc 0010 e8cc
2226020 0001 0063 0000 0000 ffff ffff 0300 560f 0000 3287 0000 000c 0011 1a18 0011 1a18 0001 0063 0000 0000 0008 c74c 0300 5617
2226100 0000 3287 0000 000c 0010 e9a4 0010 e9a4 0001 0063 0000 0000 0008 c80c 0200 564f 0000 3287 0000 0008 000f f16c 000f f16c
2226160 0001 0063 0000 0000 000f 6164 6469 6e67 5f6f 7065 7261 746f 7200 0000 0008 c7ac 0300 561f 0000 3287 0000 000c 0010 b5b4
2226240 0010 b5b4 0001 0063 0000 0000 0018 656c 6563 656e 745f 6173 736f 6369 6174 696f 6e5f 6c69 7374 0000 ffff ffff 0200 5627
2226320 0000 3287 0000 0008 0010 b654 0010 b654 0001 0063 0000 0000 ffff ffff 0200 562f 0000 3287 0000 0008 0011 35b0 0010 6214
2226400 0001 0063 0000 0000 0011 616c 6961 735f 6465 636c 6172 6174 696f 6e00 0008 c7ec 0200 5637 0000 3287 0000 0008 0010 b6bc
2226460 0010 b6bc 0001 0063 0000 0000 ffff ffff 0300 563f 0000 3287 0000 000c 0011 4460 0011 4460 0001 0063 0000 0000 0014 7175
2226540 616c 6966 6965 645f 6578 7072 6573 7369 6f6e 0000 ffff ffff 0200 5647 0000 3287 0000 0008 0010 b794 0010 b794 0001 0063
2226620 0000 0000 0011 6172 6368 6974 6563 7475 7265 5f62 6f64 7900 001e 7075 7464 625f 6172 6368 6974 6563 7475 7265 5f64 6563
2226700 6c61 7261 7469 6f6e 0000 0000 001d 6172 6368 6974 6563 7475 7265 5f64 6563 6c61 7261 7469 7665 5f70 6172 7400 001b 6172
2226760 6368 6974 6563 7475 7265 5f73 7461 7465 6d65 6e74 5f70 6172 7400 0000 0022 7075 7464 625f 656e 645f 6172 6368 6974 6563
2227040 7475 7265 5f64 6563 6c61 7261 7469 6f6e 0000 0000 0008 c84c 0200 5657 0000 3287 0000 0008 0010 b80c 0010 b80c 0001 0063
2227120 0000 0000 ffff ffff 0200 565f 0000 3287 0000 0008 0011 c1ac 0011 c1ac 0001 0067 0000 0000 ffff ffff 0200 5667 0000 3287
2227200 0000 0008 0010 f298 0011 17c0 0001 0063 0000 0000 ffff ffff 0200 566f 0000 3287 0000 0008 0010 f28c 0011 1818 0001 0063
2227260 0000 0000 000c ea00 0300 5677 0000 3287 0000 000c 0011 636c 0011 636c 0001 0063 0000 0000 000c ea48 0200 567f 0000 3287
2227340 0000 0008 0011 db70 0011 db70 0001 0067 0000 0000 000c eac4 0000 5687 0000 3287 0000 0000 0012 006c 0012 006c 0001 0067
2227420 0000 0000 0016 626c 6f63 6b5f 6465 636c 6172 6174 6976 655f 6974 6563 0000 0000 2954 0020 0002 438a 2520 46ec 3310 247c
2227500 0011 17f0 0014 37f0 3cf4 234c 0011 1714 000c eb0c 0200 568f 0000 3287 0000 0008 0010 c46c 0010 c46c 0001 0063 0000 0000
2227560 0014 636f 6e63 7572 7265 6e74 5f73 7461 7465 6d65 6e74 0000 2954 0020 0002 438a 2520 46ec 3310 247c 0011 1848 0014 37f0
2227640 3cf4 234c 0011 1734 ffff ffff 0200 5697 0000 3287 0000 0008 0010 4fd8 0010 4fd8 0001 0063 0000 0000 0015 6172 7261 795f
2227720 7479 7065 5f64 6566 696e 6974 696f 6e00 001e 756e 636f 6e73 7472 6169 6e65 645f 6172 7261 795f 6465 6669 6e69 7469 6f6e
2230000 0000 0000 001c 636f 6e73 7472 6169 6e65 645f 6172 7261 795f 6465 6669 6e69 7469 6f6e 0000 ffff ffff 0200 569f 0000 3287
2230060 0000 0008 0011 19d4 0011 18d4 0001 0063 0000 0000 2c78 0020 0002 438a 45b8 46ec 2ba0 0014 0008 2330 0011 1904 2c58 2330
2230140 0011 1924 000c e1fc 0200 56a7 0000 3287 0000 0008 000f 9bcc 000f 9bcc 0001 0063 0000 0000 ffff ffff 0200 56af 0000 3287
2230220 0000 0008 0010 d0c8 0010 d0c8 0001 0063 0000 0000 0013 6173 7365 7274 696f 6e5f 7374 6174 656d 656e 7400 0000 000c ecec
2230300 0200 56b7 0000 3287 0000 0008 0010 b9d4 0010 b9d4 0001 0063 0000 0000 0008 c92c 0200 56bf 0000 3287 0000 0008 000a 18f0
2230360 000a 18f0 0000 0000 0000 0000 0011 141c 0200 55f7 0000 3287 0000 0008 000a 18f0 000a 18f0 0000 0000 0000 0000 ffff ffff
2230440 0100 56c7 0000 3287 0000 0004 0011 df0c 0011 df0c 0001 0067 0000 0000 0013 6173 736f 6369 6174 696f 6e5f 656c 656d 656e
2230520 7400 0000 000c ee54 0300 56cf 0000 3287 0000 000c 0010 e048 0010 e048 0001 0063 0000 0000 27f0 0014 0010 bbb4 56f8 671c
2230600 5370 22bc 0011 19f4 2cac 0000 0002 438a 2ca0 0000 0000 0000 0000 0011 1a04 0010 bbb4 0010 f268 0010 f0a8 0015 6174
2230660 7472 6962 7574 655f 6465 636c 6172 6174 696f 6e00 0008 c98c 0200 56d7 0000 3287 0000 0008 0010 bc9c 0010 bc9c 0001 0063
2230740 0000 0000 0008 c9ec 0300 56df 0000 3287 0000 000c 000d c7a0 000d c7a0 0001 0063 0000 0000 0014 6174 7472 6962 7574 655f
2231020 6465 7369 676e 6174 6f72 0000 ffff ffff 0200 56e7 0000 3287 0000 0008 0011 1acc 0011 1acc 0001 0063 0000 0000 2c78 0014
2231100 0002 438a 3640 35c8 31f0 22bc 0011 1754 000e 6174 7472 6962 7574 655f 6e61 6d65 0000 0000 ffff ffff 0200 56ef 0000 3287
2231160 0000 0008 0010 b154 0010 bd54 0001 0063 0000 0000 0008 ca0c 0300 56f7 0000 3287 0000 000c 0011 589c 0011 589c 0001 0063
2231240 0000 0000 0017 6174 7472 6962 7574 655f 7370 6563 6966 6963 6174 696f 6e00 0000 0014 656e 7469 7479 5f73 7065 6369 6669
2231320 6361 7469 6f6e 0000 0008 ca2c 0200 56ff 0000 3287 0000 0008 0010 bdf4 0010 bdf4 0001 0063 0000 0000 0008 ca4c 0200 5707
2231400 0000 3287 0000 0008 0010 8164 0010 8164 0001 0063 0000 0000 0010 e2e0 0200 551f 0000 3287 0000 0008 0010 d8cc 0010 d8cc
2231460 0001 0063 0000 0000 0010 e460 0200 253f 0000 3287 0000 0008 0011 4924 0011 4924 0001 0063 0000 0000 000e 6261 7365 5f73
2231540 7065 6369 6669 6572 0000 0000 0008 ca6c 0200 570f 0000 3287 0000 0008 0010 bec4 0010 bec4 0001 0063 0000 0000 0015 6261
2231620 7365 5f75 6e69 745f 6465 636c 6172 6174 696f 6e00 ffff ffff 0300 5717 0000 3287 0000 000c 0011 1c54 0011 1c54 0001 0063
2231700 0000 0000 2c78 0024 0002 438a 2520 4740 33bc 247c 0011 15dc 0014 3d00 56f8 4af8 0000 04df 6d0c 723c 000e 6578 7465 6e64
2231760 6564 5f64 6967 6974 0000 0000 ffff ffff 0200 571f 0000 3287 0000 0008 0010 d744 0010 bf78 0001 0063 0000 0000 000f 5340
2232040 0200 5727 0000 3287 0000 0008 0011 3d8c 0011 3d8c 0001 0063 0000 0000 0010 d528 0200 5477 0000 3287 0000 0008 000a 18f0
2232120 000a 18f0 0000 0000 0000 0000 ffff ffff 0200 572f 0000 3287 0000 0008 0010 368c 0010 368c 0001 0063 0000 0000 000f 6261
2232200 7369 635f 6368 6172 6163 7465 7200 0000 0017 6261 7369 635f 6772 6170 6869 635f 6368 6172 6163 7465 7200 0000 ffff ffff
2232260 0300 5737 0000 3287 0000 000c 0011 1d5c 0011 1d5c 0001 0063 0000 0000 2c78 0024 0002 438a 45b8 46ec 4768 2ba0 0018 000a
2232340 23fc 0000 0011 1490 2c58 231c 0010 ea64 ffff ffff 0300 573f 0000 3287 0000 000c 0010 c0e4 0010 c0e4 0001 0063 0000 0000
2232420 0011 7570 7065 725f 6361 7365 5f6c 6574 7465 7200 0011 7370 6563 6961 6c5f 6368 6172 6163 7465 7200 000f 7370 6163 655f
```

```
2232500 6368 6172 6163 7465 7200 0000 ffff ffff 0300 5747 0000 3287 0000 000c 000a 18f0 000a 18f0 0000 0000 0000 0000 ffff ffff
2232560 0300 574f 0000 3287 0000 000c 000a 18f0 000a 18f0 0000 0000 0000 0000 0008 caac 0300 5757 0000 3287 0000 000c 000a 18f0
2232640 000a 18f0 0000 0000 0000 0000 0012 6269 6e64 696e 675f 696e 6469 6361 7469 6f6e 0000 0000 0012 6765 6e65 7269 635f 6d61
2232720 705f 6173 7065 6374 0000 0000 000f 706f 7274 5f6d 6170 5f61 7370 6563 7400 0000 0008 caec 0200 575f 0000 3287 0000 0008
2233000 0010 c158 0010 c158 0001 0063 0000 0000 ffff ffff 0200 5767 0000 3287 0000 0008 0010 6e1c 0010 6e1c 0001 0063 0000 0000
2233060 ffff ffff 0200 576f 0000 3287 0000 0008 0010 0104 0010 0104 0001 0063 0000 0000 ffff ffff 0200 5777 0000 3287 0000 0008
2233140 000f ed18 000f ed18 0001 0063 0000 0000 0012 6269 745f 7374 7269 6e67 5f6c 6974 6572 616c 0000 0000 0008 af8c 0200 577f
2233220 0000 3287 0000 0008 0010 c1e0 0010 c1e0 0001 0063 0000 0000 0008 cb0c 0200 5787 0000 3287 0000 0008 0010 a5c4 0010 c254
2233300 0001 0063 0000 0000 0013 626c 6f63 6b5f 636f 6e66 6967 7572 6174 696f 6e00 0000 0013 626c 6f63 6b5f 7370 6563 6966 6963
2233360 6174 696f 6e00 0000 000f 7573 655f 636c 6175 7365 5f6c 6973 7400 0000 0017 636f 6e66 6967 7572 6174 696f 6e5f 6974 656d
2233440 5f6c 6973 7400 0000 0008 cb2c 0200 578f 0000 3287 0000 0008 0010 c2cc 0010 c2cc 0001 0063 0000 0000 0008 cb4c 0200 5797
2233520 0000 3287 0000 0008 0010 d2ac 0010 d2ac 0001 0063 0000 0000 ffff ffff 0200 579f 0000 3287 0000 0008 0011 683c 0011 6848
2233600 0001 0063 0000 0000 0008 afcc 0200 57a7 0000 3287 0000 0008 0010 f1a8 0011 2ed4 0001 0063 0000 0000 0010 7479 7065 5f64
2233660 6563 6c61 7261 7469 6f6e 0000 0016 7375 6270 726f 6772 616d 5f64 6563 6c61 7261 7469 6f6e 0000 0000 000f 7375 6270 726f
2233740 6772 616d 5f62 6f64 7900 0000 0013 7375 6274 7970 655f 6465 636c 6172 6174 696f 6e00 0000 0014 636f 6e73 7461 6e74 5f64
2234020 6563 6c61 7261 7469 6f6e 0000 0012 7369 676e 616c 5f64 6563 6c61 7261 7469 6f6e 0000 0000 0010 6669 6c65 5f64 6563 6c61
2234100 7261 7469 6f6e 0000 0015 636f 6d70 6f6e 656e 745f 6465 636c 6172 6174 696f 6e00 001b 636f 6e66 6967 7572 6174 696f 6e5f
2234160 7370 6563 6966 6963 6174 696f 6e00 0000 001b 6469 7363 6f6e 6e65 6374 696f 6e5f 7370 6563 6966 6963 6174 696f 6e00 0000
2234240 000a 7573 655f 636c 6175 7365 0000 0000 2aa8 4a84 000b 5dcc 0013 a3f2 0013 804c 000d 7ca8 0200 57af 0000 3287 0000 0008
2234320 0011 6794 0011 6794 0001 0063 0000 0000 000d 7408 0200 57b7 0000 3287 0000 0008 0011 64e4 0011 64e4 0001 0063 0000 0000
2234400 000d 7d38 0200 57bf 0000 3287 0000 0008 000d bd4c 000d bd4c 0001 0063 0000 0000 000d 7468 0200 57c7 0000 3287 0000 0008
2234460 000d c09c 000d c09c 0001 0063 0000 0000 000d 7d98 0200 57cf 0000 3287 0000 0008 0010 5e3c 0010 5e3c 0001 0063 0000 0000
2234540 000d 7dc8 0200 57d7 0000 3287 0000 0008 000d b83c 000d b83c 0001 0063 0000 0000 000d 7df8 0200 57df 0000 3287 0000 0008
2234620 0010 3a58 0010 3a58 0001 0063 0000 0000 000d 7e58 0200 57e7 0000 3287 0000 0008 0010 a0f4 0010 a0f4 0001 0063 0000 0000
2234700 000d 7eb8 0200 57ef 0000 3287 0000 0008 0010 5dbc 0010 5dbc 0001 0063 0000 0000 000d 7ee8 0200 57f7 0000 3287 0000 0008
2234760 0010 94d8 0010 94d8 0001 0063 0000 0000 000d 7f48 0200 57ff 0000 3287 0000 0008 0010 17f8 0010 17f8 0001 0063 0000 0000
2235040 0016 626c 6f63 6b5f 6465 636c 6172 6174 6976 655f 7061 7274 0000 0000 000d 7f78 0200 5807 0000 3287 0000 0008 0010 f22c
2235120 0011 22fc 0001 0063 0000 0000 000b 636f 6e63 6174 5f61 746f 6d00 0000 2954 0020 0002 438a 2520 46ec 3310 247c 0011 17f0
2235200 0014 37f0 3cf4 234c 0011 22dc 000c 626c 6f63 6b5f 6865 6164 6572 0000 000e 6765 6e65 7269 635f 636c 6175 7365 0000 0000
2235260 000b 706f 7274 5f63 6c61 7573 6500 0000 000d 7fa8 0200 580f 0000 3287 0000 0008 0010 d1c8 0010 d1c8 0001 0063 0000 0000
2235340 000b 696f 6e6f 6465 5f6c 6973 7400 0000 0001 7fd8 0200 5817 0000 3287 0000 0008 000f fe04 000f fe04 0001 0063 0000 0000
2235420 000d 8008 0200 581f 0000 3287 0000 0008 000f e8ac 000f e8ac 0001 0063 0000 0000 0013 696e 6465 785f 7370 6563 6966 6963
2235500 6174 696f 6e00 0000 2c78 0010 0002 438a 239c 0000 0012 10d0 0011 1558 0300 2627 0000 3287 0000 000c 0011 4ce8 0011 4ce8
2235560 0001 0063 0000 0000 000d 8038 0200 5827 0000 3287 0000 0008 0011 4790 0011 4790 0001 0063 0000 0000 000f 626c 6f63 6b5f
2235640 7374 6174 656d 656e 7400 0000 0014 626c 6f63 6b5f 7374 6174 656d 656e 745f 7061 7274 0000 000d 8098 0200 582f 0000 3287
2235720 0000 0008 0010 9bf0 0010 9bf0 0001 0063 0000 0000 000d d5f4 0200 5837 0000 3287 0000 0008 0010 f220 0011 24a4 0001 0063
2236000 0000 0000 000d 656e 7469 7479 5f70 6172 656e 7400 2954 0020 0002 438a 2520 46ec 3310 247c 0011 1848 0014 37f0 3cf4 234c
2236060 0011 2484 000e 6361 7365 5f73 7461 7465 6d65 6e74 0000 0000 001a 6361 7365 5f73 7461 7465 6d65 6e74 5f61 6c74 6572 6e61
2236140 7469 7665 0000 0000 001f 6361 7365 5f73 7461 7465 6d65 6e74 5f61 6c74 6572 6e61 7469 7665 5f6c 6973 7400 0000 000d d624
2236220 0200 583f 0000 3287 0000 0008 0010 9d64 0010 9d64 0001 0063 0000 0000 29c8 2498 0011 25a8 000b 72c2 000b 74bc 000d 8128
2236300 0200 5847 0000 3287 0000 0008 0010 9e00 0010 9e00 0001 0063 0000 0000 000d 8158 0200 584f 0000 3287 0000 0008 0010 f208
2236360 0011 2608 0001 0063 0000 0000 0016 7365 7175 656e 6365 5f6f 665f 7374 6174 656d 656e 7473 0000 0000 2b24 2540 0002 438a
2236440 000b 72ee 0013 80e4 000d 8188 0200 5857 0000 3287 0000 0008 0011 2748 0010 9fbc 0001 0063 0000 0000 000d 81b8 0200 585f
2236520 0000 3287 0000 0008 0011 6098 0011 60a4 0001 0063 0000 0000 0000 6d37 b328 0000 0013 e8bc 0000 0000 2954 0020 0002 438a
2236600 2520 46ec 3310 247c 0011 255c 0014 37f0 3cf4 234c 0011 257c 0011 6368 6172 6163 7465 725f 6c69 7465 7261 6c00 0011 6772
2236660 6170 6869 635f 6368 6172 6163 7465 7200 000d 81e8 0200 5867 0000 3287 0000 0008 0010 9ecc 0010 9ecc 0001 0063 0000 0000
2236740 000b 656e 7469 7479 5f6e 6161 6500 0000 000d 8218 0200 586f 0000 3287 0000 0008 0010 017c 0010 017c 0001 0063 0000 0000
2237020 0011 7369 6d70 6c65 5f65 7870 7265 7373 696f 6e00 000e 6469 7363 7265 7465 5f72 616e 6765 0000 0000 000b 184c 0200 5877
2237100 0000 3287 0000 0008 0010 9f34 0010 9f34 0001 0063 0000 0000 29c8 2674 0011 2738 000b 59ba 000b 728c 000d 6cdc 0300 587f
2237160 0000 3287 0000 000c 0011 62c8 0011 62f8 0001 0063 0000 0000 000b 187c 0200 5887 0000 3287 0000 0008 000a 18f0 000a 18f0
2237240 0000 0000 0000 0000 2b24 26ec 0002 439a 000b 4ece 0000 0000 27f0 0010 0010 9fbc 239c 0000 0011 26d8 0017 636f 6d70 6f6e
2237320 656e 745f 636f 6e66 6967 7572 6174 696f 6e00 0000 0017 636f 6d70 6f6e 656e 745f 7370 6563 6966 6963 6174 696f 6e00 0000
2237400 000d 6e60 0200 588f 0000 3287 0000 0008 0010 a020 0010 a020 0001 0063 0000 0000 000c 636f 6e63 6174 5f63 6861 7273 0000
2237460 000d 71ac 0200 5897 0000 3287 0000 0008 000a 18f0 000a 18f0 0000 0000 0000 0000 2c78 0010 0002 438a 239c 0000 0012 1218
2237540 000c 4128 0400 0ad7 0000 3287 0000 0010 000a 18f0 000a 18f0 0000 0000 0000 0000 0021 636f 6d70 6f6e 656e 745f 696e 7374
```

| | | | | | | | | | | | | | | | | | | | | | | | | |
|---|---|---|---|---|---|---|---|---|---|---|---|---|---|---|---|---|---|---|---|---|---|---|---|---|
| 2237620 | 616e | 7469 | 6174 | 696f | 6e5f | 7374 | 6174 | 656d | 656e | 7400 | 000d | 764c | 0200 | 589f | 0000 | 3287 | 0000 | 0008 | 0010 | a1b8 | 0010 | a1b8 | 0001 | 0063 |
| 2237700 | 0000 | 0000 | 2b24 | 27e4 | 0002 | 438a | 000b | 531e | 0014 | 101c | 0019 | 636f | 6d70 | 6f73 | 6974 | 655f | 7479 | 7065 | 5f64 | 6566 | 696e | 6974 | 696f | 6e00 |
| 2237760 | 0016 | 7265 | 636f | 7264 | 5f74 | 7970 | 655f | 6465 | 6669 | 6e69 | 7469 | 6f6e | 0000 | 0000 | 000d | 702c | 0200 | 58a7 | 0000 | 3287 | 0000 | 0008 | 0010 | a220 |
| 2240040 | 0010 | a220 | 0001 | 0063 | 0000 | 0000 | 29c8 | 2858 | 0011 | 2930 | 000b | 6dea | 0014 | 1224 | 000d | 704c | 0200 | 58af | 0000 | 3287 | 0000 | 0008 | 000f | f3e0 |
| 2240120 | 000f | f3e0 | 0001 | 0063 | 0000 | 0000 | 001e | 636f | 6e63 | 7572 | 7265 | 6e74 | 5f61 | 7373 | 6572 | 7469 | 6f6e | 5f73 | 7461 | 7465 | 6d65 | 6e74 | 0000 | 0000 |
| 2240200 | 000d | 7b08 | 0200 | 58b7 | 0000 | 3287 | 0000 | 0008 | 0010 | 48a0 | 0010 | 48a0 | 0001 | 0063 | 0000 | 0000 | 2aa8 | 28c0 | 0011 | 2854 | 000b | 6e46 | 0014 | 12dc |
| 2240260 | 0019 | 636f | 6e63 | 7572 | 7265 | 6e74 | 5f70 | 726f | 6365 | 6475 | 7265 | 5f63 | 616c | 6c00 | 0018 | 7072 | 6f63 | 6564 | 7572 | 655f | 6361 | 6c6c | 5f73 | 7461 |
| 2240340 | 7465 | 6d65 | 6e74 | 0000 | 000d | 656e | 7469 | 7479 | 5f69 | 6e70 | 7574 | 7300 | 000d | d3b4 | 0200 | 58c7 | 0000 | 3287 | 0000 | 0008 | 000f | ee80 | 000f | eec4 |
| 2240420 | 0001 | 0063 | 0000 | 0000 | 001d | 636f | 6e64 | 6974 | 696f | 6e61 | 6c5f | 7369 | 676e | 616c | 5f61 | 7373 | 6967 | 6e6d | 656e | 7400 | 000d | d3e4 | 0200 | 58cf |
| 2240500 | 0000 | 3287 | 0000 | 0008 | 0010 | 4c68 | 0010 | 4e04 | 0001 | 0063 | 0000 | 0000 | 29c8 | 297c | 0011 | 2a84 | 000b | 6d5a | 0014 | 13a8 | 000d | d414 | 0200 | 58d7 |
| 2240560 | 0000 | 3287 | 0000 | 0008 | 0010 | 5800 | 0010 | 5800 | 0001 | 0063 | 0000 | 0000 | 001a | 7365 | 6c65 | 6374 | 6564 | 5f73 | 6967 | 6e61 | 6c5f | 6173 | 7369 | 676e |
| 2240640 | 6d65 | 6e74 | 0000 | 0000 | 000d | d444 | 0200 | 58df | 0000 | 3287 | 0000 | 0008 | 000d | b1c4 | 000d | b1c4 | 0001 | 0063 | 0000 | 0000 | 0011 | 7072 | 6f63 | 6573 |
| 2240720 | 735f | 7374 | 6174 | 656d | 656e | 7400 | 0012 | 6765 | 6e65 | 7261 | 7465 | 5f73 | 7461 | 7465 | 6d65 | 6e74 | 0000 | 0000 | 2b24 | 29ec | 0002 | 438a | 000b | 58c6 |
| 2241000 | 0014 | 7e8c | 000d | d474 | 0200 | 58e7 | 0000 | 3287 | 0000 | 0008 | 000f | efd8 | 000f | efd8 | 0001 | 0063 | 0000 | 0000 | 000d | d4d4 | 0200 | 58ef | 0000 | 3287 |
| 2241060 | 0000 | 0008 | 000f | fcb8 | 000f | fcb8 | 0001 | 0063 | 0000 | 0000 | 0019 | 636f | 6e63 | 7572 | 7265 | 6e74 | 5f73 | 7461 | 7465 | 6d65 | 6e74 | 5f6c | 6973 | 7400 |
| 2241140 | 000d | d534 | 0200 | 58f7 | 0000 | 3287 | 0000 | 0008 | 0010 | f1f0 | 0011 | 2b20 | 0001 | 0063 | 0000 | 0000 | 000d | 636f | 6e63 | 6174 | 5f73 | 7472 | 696e | 6700 |
| 2241220 | 2954 | 0020 | 0002 | 438a | 2520 | 46ec | 3310 | 247c | 0011 | 1848 | 0014 | 37f0 | 3cf4 | 234c | 0011 | 2b00 | 0011 | 196c | 0300 | 56bf | 0000 | 3287 | 0000 | 000c |
| 2241300 | 0011 | 2b70 | 0011 | 2b70 | 0001 | 0063 | 0000 | 0000 | 29c8 | 2b14 | 000a | f4cc | 000b | 6cca | 0014 | 8044 | 2c78 | 0010 | 0002 | 438a | 239c | 0000 | 0011 | 142c |
| 2241360 | 0010 | 636f | 6e64 | 6974 | 696f | 6e5f | 636c | 6175 | 7365 | 0000 | 000d | d564 | 0200 | 58ff | 0000 | 3287 | 0000 | 0008 | 0011 | 2bdc | 0011 | 2bdc | 0001 | 0063 |
| 2241440 | 0000 | 0000 | 2c78 | 0010 | 0002 | 438a | 239c | 0000 | 0012 | 35f0 | 2c78 | 0018 | 0002 | 438a | 56f8 | 4af8 | 0000 | 53b7 | 671c | 22bc | 0011 | 197c | 2cac | 0000 |
| 2241520 | 0002 | 438a | 2ca0 | 0000 | 0000 | 0000 | 0000 | 0000 | 0011 | 2bc4 | 0011 | 2bc4 | 0011 | 2bce | 0011 | 2c00 | 0000 | 0000 | 0015 | 636f | 6e64 | 6974 | 696f | 6e61 |
| 2241600 | 6c5f | 7761 | 7665 | 666f | 726d | 7300 | 000a | 7370 | 616e | 5f72 | 6967 | 6874 | 0000 | 0000 | 000d | d594 | 0300 | 5907 | 0000 | 3287 | 0000 | 000c | 0011 | 668c |
| 2241660 | 0011 | 668c | 0001 | 0063 | 0000 | 0000 | 000d | d5c4 | 0200 | 590f | 0000 | 3287 | 0000 | 0008 | 000f | e068 | 000f | e068 | 0001 | 0063 | 0000 | 0000 | 000d | d654 |
| 2241740 | 0200 | 5917 | 0000 | 3287 | 0000 | 0008 | 0011 | 2cb8 | 0011 | 2cb8 | 0001 | 0063 | 0000 | 0000 | 0019 | 636f | 6e64 | 6974 | 696f | 6e61 | 6c5f | 7761 | 7665 | 666f |
| 2242020 | 726d | 5f6c | 6f6f | 7000 | 2c78 | 0010 | 0002 | 438a | 239c | 0000 | 0012 | 3654 | 2c78 | 0020 | 0002 | 438a | 2520 | 46ec | 3310 | 247c | 0011 | 2ce8 | 0014 | 37f0 |
| 2242100 | 3cf4 | 234c | 0011 | 2108 | 000d | d684 | 0200 | 591f | 0000 | 3287 | 0000 | 0008 | 0010 | f1c0 | 0010 | 5a34 | 0001 | 0063 | 0000 | 0000 | 000d | d6b4 | 0200 | 5927 |
| 2242160 | 0000 | 3287 | 0000 | 0008 | 000a | 18f0 | 000a | 18f0 | 0000 | 0000 | 0000 | 0000 | 000d | 6e75 | 6d62 | 6572 | 5f63 | 6861 | 7273 | 3100 | 0019 | 636f | 6e66 | 6967 |
| 2242240 | 7572 | 6174 | 696f | 6e5f | 6465 | 636c | 6172 | 6174 | 696f | 6e00 | 001e | 636f | 6e66 | 6967 | 7572 | 6174 | 696f | 6e5f | 6465 | 636c | 6172 | 6174 | 6976 | 655f |
| 2242320 | 7061 | 7274 | 0000 | 0000 | 000d | 16e4 | 0200 | 592f | 0000 | 3287 | 0000 | 0008 | 0010 | 5ab0 | 0010 | 5ab0 | 0001 | 0063 | 0000 | 0000 | 000d | 696f | 6e6f | 6465 |
| 2242400 | 5f61 | 6e64 | 5f69 | 6400 | 000d | d714 | 0200 | 5937 | 0000 | 3287 | 0000 | 0008 | 0010 | f1b4 | 0011 | 2e3c | 0001 | 0063 | 0000 | 0000 | 001e | 636f | 6e66 | 6967 |
| 2242460 | 7572 | 6174 | 696f | 6e5f | 6465 | 636c | 6172 | 6174 | 6976 | 655f | 6974 | 656d | 0000 | 0000 | 000d | d7a4 | 0200 | 593f | 0000 | 3287 | 0000 | 0008 | 0011 | 2e0c |
| 2242540 | 0011 | 2e0c | 0001 | 0063 | 0000 | 0000 | 2c78 | 0010 | 0002 | 438a | 239c | 0000 | 0012 | 36d4 | 2c78 | 0020 | 0002 | 438a | 45b8 | 46ec | 2ba0 | 0014 | 0008 | 2330 |
| 2242620 | 0011 | 22a0 | 2c58 | 2330 | 0011 | 1b78 | 000a | 6c65 | 6e67 | 7468 | 6c69 | 7374 | 0000 | 0000 | 2954 | 0020 | 0002 | 438a | 2520 | 46ec | 3310 | 247c | 0011 | 2dec |
| 2242700 | 0014 | 37f0 | 3cf4 | 234c | 0011 | 21a8 | 0012 | 636f | 6e66 | 6967 | 7572 | 6174 | 696f | 6e5f | 6974 | 656d | 0000 | 0000 | 000c | 190c | 0200 | 5947 | 0000 | 3287 |
| 2242760 | 0000 | 0008 | 0011 | 2ea4 | 0011 | 2ea4 | 0001 | 0063 | 0000 | 0000 | 000d | 7374 | 7269 | 6e67 | 5f61 | 7070 | 656e | 6400 | 2c78 | 0020 | 0002 | 438a | 45b8 | 46ec |
| 2243040 | 2ba0 | 0014 | 0008 | 2330 | 0011 | 1fc8 | 2c58 | 2330 | 0011 | 27a0 | 2c78 | 0010 | 0002 | 438a | 239c | 0000 | 0012 | 3a08 | 2954 | 0020 | 0002 | 438a | 2520 | 46ec |
| 2243120 | 3310 | 247c | 0011 | 2ed4 | 0014 | 37f0 | 3cf4 | 234c | 0011 | 2928 | 0000 | 6aef | b328 | 0010 | 0013 | 5888 | 0000 | 0000 | 000f | 6964 | 656e | 7469 | 6669 | 6572 |
| 2243200 | 5f6c | 6973 | 7400 | 0000 | 0000 | 6aef | b328 | 0010 | 0013 | 58b4 | 0000 | 0000 | 000c | 193c | 0300 | 594f | 0000 | 3287 | 0000 | 000c | 0011 | 44f8 | 0011 | 44f8 |
| 2243260 | 0001 | 0063 | 0000 | 0000 | 0010 | 696e | 6465 | 785f | 636f | 6e73 | 7472 | 6169 | 6e74 | 0000 | 2c78 | 0010 | 0002 | 438a | 239c | 0000 | 0012 | 3a80 | 000d | cc64 |
| 2243340 | 0200 | 5957 | 0000 | 3287 | 0000 | 0008 | 0010 | 6038 | 0010 | 6038 | 0001 | 0063 | 0000 | 0000 | 000a | 636f | 6e73 | 7472 | 6169 | 6e74 | 0000 | 0000 | 0010 | 7261 |
| 2243420 | 6e67 | 655f | 636f | 6e73 | 7472 | 6169 | 6e74 | 0000 | 000d | cd5c | 0200 | 595f | 0000 | 3287 | 0000 | 0008 | 0011 | 2fe0 | 0011 | 2fe0 | 0001 | 0063 | 0000 | 0000 |
| 2243500 | 0000 | 6c3f | b328 | 0010 | 0013 | 9420 | 0000 | 0000 | 2c78 | 0020 | 0002 | 438a | 45b8 | 46ec | 2ba0 | 0014 | 0008 | 2330 | 0011 | 3010 | 2c58 | 2330 | 0011 | 2f7c |
| 2243560 | 000d | ce00 | 0200 | 5967 | 0000 | 3287 | 0000 | 0008 | 0011 | 5c1c | 0011 | 5c1c | 0001 | 0063 | 0000 | 0000 | 000e | 636f | 6e74 | 6578 | 745f | 636c | 6175 | 7365 |
| 2243640 | 0000 | 0000 | 000d | d270 | 0200 | 596f | 0000 | 3287 | 0000 | 0008 | 0010 | e220 | 0011 | 3074 | 0001 | 0063 | 0000 | 0000 | 2c78 | 0010 | 0002 | 438a | 239c | 0000 |
| 2243720 | 0012 | 0fe4 | 000c | 636f | 6e74 | 6578 | 745f | 6974 | 656d | 0000 | 2954 | 0020 | 0002 | 438a | 2520 | 46ec | 3310 | 247c | 0011 | 30a4 | 0014 | 37f0 | 3cf4 | 234c |
| 2244000 | 0011 | 3044 | 000d | d2fc | 0200 | 5977 | 0000 | 3287 | 0000 | 0008 | 0010 | d1a8 | 0010 | d1a8 | 0001 | 0063 | 0000 | 0000 | 000e | 6c69 | 6272 | 6172 | 795f | 636c |
| 2244060 | 6175 | 7365 | 0000 | 0000 | 2c78 | 0010 | 0002 | 438a | 239c | 0000 | 0012 | 10d0 | 000c | 1afc | 0200 | 597f | 0000 | 3287 | 0000 | 0008 | 0010 | 1558 | 0010 | 1558 |
| 2244140 | 0001 | 0063 | 0000 | 0000 | 000c | 696f | 5f76 | 6172 | 735f | 6c69 | 7374 | 0000 | 000b | 6465 | 636c | 6172 | 6174 | 696f | 6e00 | 0000 | 0012 | 6f62 | 6a65 | 6374 |
| 2244220 | 5f64 | 6563 | 6c61 | 7261 | 7469 | 6f6e | 0000 | 0000 | 0015 | 696e | 7465 | 7266 | 6163 | 655f | 6465 | 636c | 6172 | 6174 | 696f | 6e00 | 0012 | 656e | 7469 | 7479 |
| 2244300 | 5f64 | 6563 | 6c61 | 7261 | 7469 | 6f6e | 0000 | 0000 | 0013 | 7061 | 636b | 6167 | 655f | 6465 | 636c | 6172 | 6174 | 696f | 6e00 | 0000 | 000c | 1b5c | 0200 | 5987 |
| 2244360 | 0000 | 3287 | 0000 | 0008 | 0010 | 45a0 | 0010 | 45a0 | 0001 | 0063 | 0000 | 0000 | 0000 | 6c3f | b328 | 0000 | 0013 | 844c | 0000 | 0000 | 000e | 1890 | 0200 | 598f |
| 2244440 | 0000 | 3287 | 0000 | 0008 | 000f | dfcc | 000f | dfcc | 0001 | 0063 | 0000 | 0000 | 000e | 18f0 | 0200 | 5997 | 0000 | 3287 | 0000 | 0008 | 0010 | 0d84 | 0010 | 0d84 |
| 2244520 | 0001 | 0063 | 0000 | 0000 | 000c | 1c8c | 0200 | 599f | 0000 | 3287 | 0000 | 0008 | 0010 | 7030 | 0010 | 7030 | 0001 | 0063 | 0000 | 0000 | 000c | 1cbc | 0200 | 59a7 |
| 2244600 | 0000 | 3287 | 0000 | 0008 | 000f | e31c | 000f | e31c | 0001 | 0063 | 0000 | 0000 | 000b | 6465 | 7369 | 676e | 5f66 | 696c | 6500 | 0000 | 000b | 6465 | 7369 | 676e |
| 2244660 | 5f75 | 6e69 | 7400 | 0000 | 000c | 1cec | 0200 | 59af | 0000 | 3287 | 0000 | 0008 | 0011 | 3278 | 0011 | 32a8 | 0001 | 0063 | 0000 | 0000 | 2c78 | 0010 | 0002 | 438a |

| | | | | | | | | | | | | | | | | | | | | | | | | |
|---|---|---|---|---|---|---|---|---|---|---|---|---|---|---|---|---|---|---|---|---|---|---|---|---|
| 2244740 | 239c | 0000 | 0012 | 0fc4 | 27f0 | 0010 | 0011 | 32a8 | 239c | 0000 | 0011 | 3298 | 000c | 1d1c | 0200 | 59b7 | 0000 | 3287 | 0000 | 0008 | 0011 | 32e8 | 0011 | 32e8 |
| 2245020 | 0001 | 0063 | 0000 | 0000 | 2954 | 0020 | 0002 | 438a | 2520 | 46ec | 3310 | 247c | 0011 | 3298 | 0014 | 37f0 | 3cf4 | 234c | 0011 | 3258 | 000c | 6c69 | 6272 | 6172 |
| 2245100 | 795f | 756e | 6974 | 0000 | 2c78 | 0010 | 0002 | 438a | 239c | 0000 | 0013 | 135c | 2c78 | 0010 | 0002 | 438a | 239c | 0000 | 0011 | 3308 | 000e | 1f04 | 0200 | 59bf |
| 2245160 | 0000 | 3287 | 0000 | 0008 | 0011 | 4e68 | 0011 | 4e68 | 0001 | 0063 | 0000 | 0000 | 000a | 6465 | 7369 | 676e | 6174 | 6f72 | 0000 | 0000 | 000f | 6f70 | 6572 | 6174 |
| 2245240 | 6f72 | 5f73 | 796d | 626f | 6c00 | 0000 | 000e | 1930 | 0300 | 59c7 | 0000 | 3287 | 0000 | 000c | 0011 | 336c | 0011 | 336c | 0001 | 0063 | 0000 | 0000 | 2c78 | 0010 |
| 2245320 | 0002 | 438a | 239c | 0000 | 0012 | 1218 | 2c78 | 0024 | 0002 | 438a | 45b8 | 46ec | 4768 | 2ba0 | 0018 | 000a | 23fc | 0000 | 0011 | 15dc | 2c58 | 231c | 0011 | 33a0 |
| 2245400 | 000e | 1950 | 0300 | 59cf | 0000 | 3287 | 0000 | 000c | 0011 | 5488 | 0011 | 5488 | 0001 | 0063 | 0000 | 0000 | 000a | 6469 | 6769 | 745f | 6c69 | 7374 | 0000 | 0000 |
| 2245460 | 0008 | d1cc | 0200 | 59d7 | 0000 | 3287 | 0000 | 0008 | 0011 | 33f0 | 0010 | 9498 | 0001 | 0063 | 0000 | 0000 | 2c78 | 0010 | 0002 | 438a | 239c | 0000 | 0013 | 133c |
| 2245540 | 27f0 | 0010 | 0010 | 9498 | 239c | 0000 | 0011 | 3410 | 0010 | d714 | 0200 | 20df | 0000 | 3287 | 0000 | 0008 | 000a | 18f0 | 000a | 18f0 | 0000 | 0000 | 0000 | 0000 |
| 2245620 | 0008 | d1ec | 0300 | 59df | 0000 | 3287 | 0000 | 000c | 0010 | 9b70 | 0010 | 9b70 | 0001 | 0063 | 0000 | 0000 | 2c78 | 0010 | 0002 | 438a | 239c | 0000 | 0012 | 35f0 |
| 2245700 | 001c | 6775 | 6172 | 6465 | 645f | 7369 | 676e | 616c | 5f73 | 7065 | 6369 | 6669 | 6361 | 7469 | 6f6e | 0000 | 2c78 | 0010 | 0002 | 438a | 239c | 0000 | 0013 | 131c |
| 2245760 | 000e | 1a58 | 0200 | 59e7 | 0000 | 3287 | 0000 | 0008 | 0010 | 0218 | 0010 | 0218 | 0001 | 0063 | 0000 | 0000 | 0011 | 2718 | 0300 | 5887 | 0000 | 3287 | 0000 | 000c |
| 2246040 | 0011 | 34d0 | 0011 | 34d0 | 0001 | 0063 | 0000 | 0000 | 2c78 | 0010 | 0002 | 438a | 239c | 0000 | 0012 | 3654 | 2c78 | 0010 | 0002 | 438a | 239c | 0000 | 0011 | 34f0 |
| 2246120 | 000f | 94bc | 0300 | 3f5f | 0000 | 3287 | 0000 | 000c | 000f | f228 | 000f | f228 | 0001 | 0063 | 0000 | 0000 | 0013 | 6469 | 7363 | 7265 | 7465 | 5f72 | 616e | 6765 |
| 2246200 | 5f6c | 6973 | 7400 | 0000 | 000e | 1b2c | 0200 | 59ef | 0000 | 3287 | 0000 | 0008 | 0011 | 3548 | 0010 | 9bbc | 0001 | 0063 | 0000 | 0000 | 27f0 | 000c | 0013 | 3470 |
| 2246260 | 48f8 | 228c | 000b | 1ff0 | 27f0 | 0010 | 0010 | 9bbc | 239c | 0000 | 0011 | 2728 | 0013 | 656c | 656d | 656e | 745f | 6173 | 736f | 6369 | 6174 | 696f | 6e00 | 0000 |
| 2246340 | 000e | 1c2c | 0200 | 59f7 | 0000 | 3287 | 0000 | 0008 | 0010 | 4520 | 0010 | 4520 | 0001 | 0063 | 0000 | 0000 | 000f | 8a1c | 0300 | 4eef | 0000 | 3287 | 0000 | 000c |
| 2246420 | 0011 | 6464 | 0011 | 6464 | 0041 | 0000 | 0000 | 0000 | 27f0 | 0010 | 0010 | 6214 | 239c | 0000 | 0011 | 3580 | 0013 | 656c | 656d | 656e | 745f | 6465 | 636c | 6172 |
| 2246500 | 6174 | 696f | 6e00 | 0000 | 001a | 656c | 656d | 656e | 745f | 7375 | 6274 | 7970 | 655f | 6465 | 6669 | 6e69 | 7469 | 6f6e | 0000 | 0000 | 000e | 1a78 | 0200 | 59ff |
| 2246560 | 0000 | 3287 | 0000 | 0008 | 0010 | 44e0 | 0010 | 44e0 | 0001 | 0063 | 0000 | 0000 | 2c78 | 0010 | 0002 | 438a | 239c | 0000 | 0013 | 12fc | 000e | 1ca4 | 0200 | 5a07 |
| 2246640 | 0000 | 3287 | 0000 | 0008 | 0011 | 36b8 | 0011 | 36b8 | 0001 | 0063 | 0000 | 0000 | 000e | 1d24 | 0200 | 5a0f | 0000 | 3287 | 0000 | 0008 | 0011 | 3578 | 0011 | 3688 |
| 2246720 | 0001 | 0063 | 0000 | 0000 | 0006 | 616e | 6368 | 6f72 | 000d | 4ae7 | 0014 | 3b68 | 27f0 | 0010 | 0011 | 3688 | 239c | 0000 | 0011 | 3608 | 2954 | 0020 | 0002 | 438a |
| 2247000 | 2520 | 46ec | 3310 | 247c | 0011 | 3608 | 0014 | 37f0 | 3cf4 | 234c | 0011 | 3659 | b464 | 4ae4 | 0012 | a9d0 | 0000 | 0000 | 0014 | 3be4 | 2c78 | 0014 | 0002 | 438a |
| 2247060 | 3640 | 35c8 | 31f0 | 22bc | 0011 | 13ec | 2c78 | 0010 | 0002 | 438a | 239c | 0000 | 0012 | 36d4 | 000c | 656e | 7469 | 7479 | 5f63 | 6c61 | 7373 | 0000 | 000e | 1dfc |
| 2247140 | 0200 | 5a17 | 0000 | 3287 | 0000 | 0008 | 0010 | 6eec | 0010 | 6eec | 0001 | 0063 | 0000 | 0000 | 29c8 | 36d0 | 000b | 5af0 | 000b | 47da | 0014 | 3f08 | 0018 | 7075 |
| 2247220 | 7464 | 625f | 656e | 7469 | 7479 | 5f64 | 6563 | 6c61 | 7261 | 7469 | 6f6e | 0000 | 001c | 7075 | 7464 | 625f | 656e | 645f | 656e | 7469 | 7479 | 5f64 | 6563 | 6c61 |
| 2247300 | 7261 | 7469 | 6f6e | 0000 | 000a | 6265 | 7477 | 6565 | 6e2e | 706c | 0000 | 0000 | 000e | 1d9c | 0100 | 5a1f | 0000 | 3287 | 0000 | 0004 | 0011 | c054 | 0011 | c054 |
| 2247360 | 0001 | 0067 | 0000 | 0000 | 000e | 1e74 | 0000 | 5a27 | 0000 | 3287 | 0000 | 0000 | 0011 | ffb0 | 0011 | ffb0 | 0001 | 0067 | 0000 | 0000 | 0017 | 656e | 7469 | 7479 |
| 2247440 | 5f64 | 6563 | 6c61 | 7261 | 7469 | 7665 | 5f69 | 7465 | 6d00 | 0000 | 0008 | d26c | 0200 | 5a2f | 0000 | 3287 | 0000 | 0008 | 0010 | 7100 | 0010 | 7100 | 0001 | 0063 |
| 2247520 | 0000 | 0000 | 0000 | 62e7 | b328 | fa54 | 0012 | 1450 | 0000 | 0000 | 0017 | 656e | 7469 | 7479 | 5f64 | 6563 | 6c61 | 7261 | 7469 | 7665 | 5f70 | 6172 | 7400 | 0000 |
| 2247600 | ffff | ffff | 0200 | 5a37 | 0000 | 3287 | 0000 | 0008 | 0010 | f190 | 0011 | 3840 | 0001 | 0063 | 0000 | 0000 | 0000 | 62e7 | b328 | 0000 | 0012 | 147c | 0000 | 0000 |
| 2247660 | 2954 | 0020 | 0002 | 438a | 2520 | 46ec | 3310 | 247c | 0011 | 37d4 | 0014 | 37f0 | 3cf4 | 234c | 0011 | 3820 | 0011 | 656e | 7469 | 7479 | 5f64 | 6573 | 6967 | 6e61 |
| 2247740 | 746f | 7200 | 0008 | d28c | 0200 | 5a3f | 0000 | 3287 | 0000 | 0008 | 0011 | 38a4 | 0011 | 38a4 | 0001 | 0063 | 0000 | 0000 | 2c78 | 0010 | 0002 | 438a | 239c | 0000 |
| 2250020 | 0012 | 3894 | 2c78 | 0028 | 0002 | 438a | 45b8 | 46ec | 2ba0 | 0014 | 0010 | 3858 | 37dc | 31f0 | 242c | 0000 | 0011 | 1754 | 2c58 | 2330 | 0011 | 38dc | 0011 | 3390 |
| 2250100 | 0200 | 59cf | 0000 | 3287 | 0000 | 0008 | 000a | 18f0 | 000a | 19f0 | 0000 | 0000 | 0000 | 0000 | 0016 | 656e | 7469 | 7479 | 5f64 | 6573 | 6967 | 6e61 | 746f | 725f |
| 2250160 | 6c69 | 7374 | 0000 | 0000 | 000e | 4a40 | 0200 | 5a47 | 0000 | 3287 | 0000 | 0008 | 0011 | 3938 | 0010 | 7f08 | 0001 | 0063 | 0000 | 0000 | 000a | 6973 | 5f63 | 6f6e |
| 2250240 | 7472 | 6f6c | 0000 | 0000 | 27f0 | 0010 | 0010 | 7f08 | 239c | 0000 | 0011 | 3884 | 000d | 656e | 7469 | 7479 | 5f68 | 6561 | 6465 | 7200 | ffff | ffff | 0200 | 5a4f |
| 2250320 | 0000 | 3287 | 0000 | 0008 | 0010 | 7f6c | 0010 | 7f6c | 0001 | 0063 | 0000 | 0000 | 29c8 | 3898 | 000b | 37b0 | 000b | 376e | 000b | 2318 | 000f | 656e | 6974 | 795f |
| 2250400 | 6e61 | 6d65 | 5f6c | 6973 | 7400 | 0000 | 0008 | d2ac | 0200 | 5a57 | 0000 | 3287 | 0000 | 0008 | 0010 | 80ec | 0010 | 80ec | 0001 | 0063 | 0000 | 0000 | 000d | 6f70 |
| 2250460 | 6572 | 6174 | 6f72 | 5f6c | 6973 | 7400 | 0010 | 656e | 7469 | 7479 | 5f6e | 616d | 655f | 6c69 | 7374 | 0000 | 000d | 6973 | 5f73 | 7461 | 7465 | 626c | 6f63 | 6b00 |
| 2250540 | 000b | 66c0 | 0200 | 5a5f | 0000 | 3287 | 0000 | 0008 | 000a | 18f0 | 000a | 18f0 | 0000 | 0000 | 0000 | 0000 | 0010 | 656e | 7469 | 7479 | 5f73 | 7461 | 7465 | 6d65 |
| 2250620 | 6e74 | 0000 | 000b | 66f0 | 0200 | 5a67 | 0000 | 3287 | 0000 | 0008 | 0010 | 81c8 | 0010 | 81c8 | 0001 | 0063 | 0000 | 0000 | 000a | 7672 | 6567 | 6973 | 7465 | 7273 |
| 2250700 | 0000 | 0000 | 0015 | 656e | 7469 | 7479 | 5f73 | 7461 | 7465 | 6d65 | 6e74 | 5f70 | 6172 | 7400 | 000e | 48c0 | 0200 | 5a6f | 0000 | 3287 | 0000 | 0008 | 0010 | f184 |
| 2250760 | 0010 | 822c | 0001 | 0063 | 0000 | 0000 | 2c78 | 0010 | 0002 | 438a | 239c | 0000 | 0012 | 3a08 | 000b | 7761 | 726e | 696e | 675f | 6967 | 6e00 | 0000 | 000e | 48f0 |
| 2251040 | 0100 | 5a77 | 0000 | 3287 | 0000 | 0004 | 0012 | 1144 | 0012 | 1144 | 0001 | 0067 | 0000 | 0000 | 0013 | 656e | 756d | 6572 | 6174 | 696f | 6e5f | 6c69 | 7465 | 7261 |
| 2251120 | 6c00 | 0000 | 000e | 4920 | 0200 | 5a7f | 0000 | 3287 | 0000 | 0008 | 0011 | 3b14 | 0011 | 3b14 | 0001 | 0063 | 0000 | 0000 | 000b | 6973 | 5f6f | 7065 | 7261 | 746f |
| 2251200 | 7200 | 0000 | 2c78 | 0020 | 0002 | 438a | 45b8 | 46ec | 2ba0 | 0014 | 0008 | 2330 | 0011 | 3b44 | 2c58 | 2330 | 0011 | 2660 | 0011 | 15cc | 0200 | 563f | 0000 | 3287 |
| 2251260 | 0000 | 0008 | 000a | 18f0 | 000a | 18f0 | 0000 | 0000 | 0000 | 0000 | 0018 | 656e | 756d | 6572 | 6174 | 696f | 6e5f | 6c69 | 7465 | 7261 | 6c5f | 6c69 | 7374 | 0000 |
| 2251340 | 000e | 4950 | 0200 | 5a87 | 0000 | 3287 | 0000 | 0008 | 0011 | 3ba0 | 0010 | 4670 | 0001 | 0063 | 0000 | 0000 | 000b | 6f70 | 5f6c | 6973 | 745f | 6175 | 7800 | 0000 |
| 2251420 | 27f0 | 0010 | 0010 | 4670 | 239c | 0000 | 0011 | 3af4 | 001b | 656e | 756d | 6572 | 6174 | 696f | 6e5f | 7479 | 7065 | 5f64 | 6566 | 696e | 6974 | 696f | 6e00 | 0000 |
| 2251500 | 000e | 4980 | 0200 | 5a8f | 0000 | 3287 | 0000 | 0008 | 0010 | 3430 | 0010 | 3430 | 0001 | 0063 | 0000 | 0000 | 000b | 6973 | 5f70 | 726f | 6362 | 6f64 | 7900 | 0000 |
| 2251560 | 000e | 6578 | 6974 | 5f73 | 7461 | 7465 | 6d65 | 6e74 | 0000 | 0000 | 000e | 49b0 | 0200 | 5a97 | 0000 | 3287 | 0000 | 0008 | 0010 | 35e0 | 0010 | 35e0 | 0001 | 0063 |
| 2251640 | 0000 | 0000 | 000f | 88e4 | 0300 | 4ee7 | 0000 | 3287 | 0000 | 000c | 0011 | 65d0 | 0011 | 65d0 | 0041 | 0000 | 0000 | 0000 | 0011 | 7265 | 6c61 | 7469 | 6f6e | 5f61 |
| 2251720 | 6e64 | 5f6c | 6973 | 7400 | 0010 | 7265 | 6c61 | 7469 | 6f6e | 5f6f | 725f | 6c69 | 7374 | 0000 | 0011 | 7265 | 6c61 | 7469 | 6f6e | 5f78 | 6f72 | 5f6c | 6973 | 7400 |
| 2252000 | 0007 | 6f70 | 5f6c | 6973 | 7400 | f764 | 000b | 1f34 | 000e | 4a10 | 0300 | 5aa7 | 0000 | 3287 | 0000 | 000c | 0011 | 5c64 | 000f | f450 | 0001 | 0063 | 0000 | 0000 |

```
2252060 000e 4aa0 0300 5aaf 0000 3287 0000 000c 0011 5ccc 0011 5ccc 0001 0063 0000 0000 000e 4b00 0300 5ab7 0000 3287 0000 000c
2252140 0011 5d20 0011 5d20 0001 0063 0000 0000 000e 474c 0300 5abf 0000 3287 0000 000c 0011 5d74 0011 5d74 0001 0063 0000 0000
2252220 000f 6578 7072 6573 7369 6f6e 5f6c 6973 7400 0000 ffff ffff 0300 5acf 0000 3287 000c 000c 0010 8388 0010 8388 0001 0063
2252300 0000 0000 0000 6acf b328 0010 0012 cd7c 0000 0000 27f0 0014 0010 3880 56f8 671c 5370 22bc 0011 142c 0000 0000 000b 7363
2252360 6865 6475 6c65 2e70 6c00 0000 2c78 0020 0002 438a 45b8 46ec 2ba0 0014 0008 2330 0011 3410 2c58 2330 0011 3dbc 0011 27f0
2252440 0200 5ad7 0000 3287 0000 0008 0011 4d80 0011 4380 0001 0063 0000 0000 000c 4148 0300 5adf 0000 3287 0000 000c 0010 3920
2252520 0010 3920 0001 0063 0000 0000 2c78 0010 0002 438a 239c 0000 0012 3a80 000c 4168 0300 5ae7 0000 3287 0000 000c 000f edc8
2252600 000f edc8 0001 0063 0000 0000 0011 6669 6c65 5f6c 6f67 6963 616c 5f6e 616d 6500 2954 0010 0002 438a 239c 0000 000b 1524
2252660 0008 d3ec 0200 5aef 0000 3287 0000 0008 000f dc40 000f dc40 0001 0063 0000 0000 0008 d40c 0200 5af7 0000 3287 0000 0008
2252740 0011 3e90 0011 3e90 0001 0063 0000 0000 2c78 0010 0002 438a 239c 0000 0012 0c40 2c78 0010 0002 438a 239c 0000 0011 199c
2253020 0014 6669 6c65 5f74 7970 655f 6465 6669 6e69 7469 6f6e 0000 ffff ffff 0200 5aff 0000 3287 0000 0008 0011 3ee8 0011 3ee8
2253100 0001 0063 0000 0000 000d 636f 6e73 7461 6e74 5f74 7970 6500 2c78 0028 0002 438a 3640 56f8 4b8c 0000 0000 2247 55f0 4af8
2253160 0000 539f 671c 35c8 31f0 22bc 0011 1a84 0018 666c 6f61 7469 6e67 5f74 7970 655f 6465 6669 6e69 7469 6f6e 0000 0008 d42c
2253240 0200 5b07 0000 3287 0000 0008 0011 3f5c 0011 3f5c 0001 0063 0000 0000 2c78 0010 0002 438a 239c 0000 0012 0fe4 2c78 0010
2253320 0002 438a 239c 0000 0011 3010 0011 666f 726d 616c 5f64 6573 6967 6e61 746f 7200 000e 72f0 0200 5b0f 0000 3287 0000 0008
2253400 0010 3bc8 0010 3bc8 0001 0063 0000 0000 000d 636f 6e73 7461 6e74 5f62 6974 7300 0015 666f 726d 616c 5f70 6172 616d 6574
2253460 6572 5f6c 6973 7400 000e 696e 7465 7266 6163 655f 6c69 7374 0000 0000 000e 7380 0200 5b17 0000 3287 0000 0008 0011 400c
2253540 0011 400c 0001 0063 0000 0000 2c78 0010 0002 438a 239c 0000 0012 0c40 2c78 0010 0002 438a 239c 0000 0011 402c 000e 7410
2253620 0200 5b1f 0000 3287 0000 0008 0011 4b24 0010 0e20 0001 0063 0000 0000 000b 666f 726d 616c 5f70 6172 7400 0000 000e 7440
2253700 0200 5b27 0000 3287 0000 0008 0010 3c7c 0010 3c7c 0001 0063 0000 0000 000d 6675 6e63 7469 6f6e 5f74 7970 6500 0015 6675
2253760 6c6c 5f74 7970 655f 6465 636c 6172 6174 696f 6e00 000f 7479 7065 5f64 6566 696e 6974 696f 6e00 0000 000b ac74 0200 5b2f
2254040 0000 3287 0000 0008 0010 3d08 0010 3d08 0001 0063 0000 0000 2c78 0010 0002 438a 239c 0000 0012 0c40 000e 6d00 0200 5b37
2254120 0000 3287 0000 0008 0010 93f0 0010 93f0 0001 0063 0000 0000 000d 6675 6e63 7469 6f6e 5f63 616c 6c00 000e 6c65 6761 6c5f
2254200 6675 6e63 7469 6f6e 0000 0000 000e 6d40 0300 5b3f 0000 3287 0000 000c 0010 3d88 0010 3dbc 0001 0063 0000 0000 000c 6e65
2254260 775f 7661 7269 6162 6c65 0000 000e 6d78 0200 5b47 0000 3287 0000 0008 0011 7420 0011 7420 0001 0065 0000 0000 0000 6c4f
2254340 b328 0010 0013 a750 0000 0000 000b af48 0200 5b57 0000 3287 0000 0008 000f fd8c 000f fd8c 0001 0063 0000 0000 0017 7061
2254420 7261 6d65 7465 725f 7370 6563 6966 6963 6174 696f 6e00 0000 2c78 0010 0002 438a 239c 0000 0012 10d0 0008 d50c 0200 5b5f
2254500 0000 3287 0000 0008 000a 18f0 000a 18f0 0000 0000 0000 0000 000c 6765 6e65 7269 635f 6c69 7374 0000 000d 6461 7461 5f64
2254560 6973 7461 6e63 6500 000b b05c 0200 5b67 0000 3287 0000 0008 0011 4254 0011 4254 0001 0063 0000 0000 0016 6765 6e65 7269
2254640 635f 696e 7465 7266 6163 655f 6c69 7374 0000 0000 000c 7479 7065 5f73 7562 7479 7065 0000 2c78 0010 0002 438a 239c 0000
2254720 0011 4274 000b b0e4 0200 5b6f 0000 3287 0000 0008 0011 4294 000f ff8c 0001 0063 0000 0000 2c78 0010 0002 438a 239c 0000
2255000 0012 0fc4 27f0 0010 000f ff8c 239c 0000 0011 42b4 000b b104 0200 5b77 0000 3287 0000 0008 000f fff0 000f fff0 0001 0063
2255060 0000 0000 000d 7479 7065 5f62 6974 7769 6474 6800 000a 6f70 5f69 645f 6c69 7374 0000 0000 0011 14a8 0200 560f 0000 3287
2255140 0000 0008 000a 18f0 000a 18f0 0000 0000 0000 0000 0011 6c6f 7765 725f 6361 7365 5f6c 6574 7465 7200 0017 6f74 6865 725f
2255220 7370 6563 6961 6c5f 6368 6172 6163 7465 7200 0000 000b 7479 7065 5f76 616c 7565 7300 0000 0011 1d80 0200 573f 0000 3287
2255300 0000 0008 000a 18f0 000a 18f0 0000 0000 0000 0000 000b b124 0200 5b7f 0000 3287 0000 0008 000a 18f0 000a 18f0 0000 0000
2255360 0000 0000 000b af90 0200 5b87 0000 3287 0000 0008 000a 18f0 000a 18f0 0000 0000 0000 0000 0016 6772 6170 6869 635f 6368
2255440 6172 6163 7465 725f 6c69 7374 0000 0000 000b b218 0200 5b8f 0000 3287 0000 0008 0010 f130 0011 43f0 0001 0063 0000 0000
2255520 000a 7072 6f63 6573 735f 6964 0000 0000 2954 0020 0002 438a 2520 46ec 3310 247c 0011 2690 0014 37f0 3cf4 234c 0011 43d0
2255600 000b 7369 676e 616c 5f6c 6973 7400 0000 2c78 0010 0002 438a 239c 0000 0012 0c40 000b b238 0200 5b97 0000 3287 0000 0008
2255660 000d baf4 000d baf4 0001 0063 0000 0000 000d 6675 6e63 7469 6f6e 5f6e 616d 6500 2c78 0010 0002 438a 5758 6b48 6bc8 7220
2255740 0010 df84 0200 5b9f 0000 3287 0000 0008 0010 f118 0010 02b4 0001 0063 0000 0000 2c78 0010 0002 438a 239c 0000 0012 0c40
2256020 000f 6c65 7474 6572 5f6f 725f 6469 6769 7400 0000 000f 5370 0200 5ba7 0000 3287 0000 0008 0011 4dd0 0011 4dd0 0001 0063
2256100 0000 0000 000b 7374 7269 6e67 5f63 6961 7200 0000 27f0 0014 0010 032c 56f8 671c 5370 22bc 0011 15dc 2cac 0000 0002 438a
2256160 2ca0 0000 0000 0000 000c 0000 0011 44e4 0010 032c 0010 f100 0011 451c 0000 0000 000c 6966 5f73 7461 7465 6d65 6e74 0000
2256240 0012 7075 7464 625f 6966 5f63 6f6e 6469 7469 6f6e 0000 0000 000b 656c 7365 6966 5f6c 6973 7400 0000 0015 656c 7365 5f6f
2256320 7074 696f 6e5f 616e 545f 656e 6469 6600 000f 53a0 0200 5baf 0000 3287 0000 0008 0010 0394 0010 0394 0001 0063 0000 0000
2256400 2c78 0010 0002 438a 239c 0000 0012 0c40 000f 53d0 0100 5bb7 0300 3287 0000 0004 0011 4308 0011 d308 0001 0067 0000 0000
2256460 000f 5400 0200 5bbf 0000 3287 0000 0008 0010 f0f4 0010 0430 0001 0063 0000 0000 000f 5430 0200 5bc7 0000 3287 0000 0008
2256540 0010 5f10 0010 5f44 0001 0063 0000 0000 2c78 0010 0002 438a 239c 0000 0012 1218 0016 7075 7464 625f 656c 7365 6966 5f63
2256620 6f6e 6469 7469 6f6e 0000 0000 000c 656c 7365 5f69 665f 6c69 7374 0000 000f 5460 0100 5bcf 0000 3287 0000 0004 000a 18f0
2256700 000a 18f0 0000 0000 0000 0000 000f 5490 0200 5bd7 0000 3287 0000 0008 000a 18f0 000a 18f0 0000 0000 0000 0000 000b 7075
2256760 7464 625f 656e 6469 6600 0000 2c78 0010 0002 438a 239c 0000 0012 0c40 000f 54c0 0000 5bdf 0000 3287 0000 0000 0011 d4d8
2257040 0011 d4d8 0001 0067 0000 0000 000a 7075 7464 625f 656c 7365 0000 0000 0010 7075 7464 625f 656c 7365 5f65 6e64 6966 0000
2257120 000f 54f0 0000 5be7 0000 3287 0000 0000 0011 d3c0 0011 d3c0 0001 0067 0000 0000 000f 5520 0000 5bef 0000 3287 0000 0000
```

```
2257200  0011 73fc 0011 73fc 0001 0067 0000 0000 001b 696e 636f 6d70 6c65 7465 5f74 7970 655f 6465 636c 6172 6174 696f 6e00 0000
2257260  000f 5550 0200 5bf7 0000 3287 0000 0008 0010 5fd0 0010 5fd0 0001 0063 0000 0000 0011 69d4 0000 0030 0011 eff4 0000 0000
2257340  0011 4784 0000 0010 0011 efbc 0000 0000 0011 47f0 0000 0010 0011 ef84 0000 0000 2c78 0020 0002 438a 45b8 46ec 2ba0 0014
2257420  0008 2330 0011 2728 2c58 2330 0011 193c 0018 696e 6465 785f 7375 6274 7970 655f 6465 6669 6e69 7469 6f6e 0000 000f 5580
2257500  0200 5bff 0000 3287 0000 0008 0010 08bc 0010 08bc 0001 0063 0000 0000 27f0 000e 000a e7a4 48f8 4950 2edc 0000 001d 696e
2257560  6465 785f 7375 6274 7970 655f 6465 6669 6e69 7469 6f6e 5f6c 6973 7400 000f 55b0 0200 5c07 0000 3287 0000 0008 0011 484c
2257640  0010 0948 0001 0063 0000 0000 000d 7661 7269 6162 6c65 5f74 7970 6500 27f0 0010 0010 0948 239c 0000 0011 47dc 000c 696e
2257720  6465 7365 645f 6e61 6d65 0000 000b 6c65 6761 6c5f 6172 7261 7900 0000 0010 840c 0300 5c0f 0000 3287 0000 000c 0010 09ac
2260000  0010 09ac 0001 0063 0000 0000 2c78 0010 0002 438a 239c 0000 0012 35f0 000f 5610 0200 5c17 0000 3287 0000 0008 0011 d730
2260060  0012 0d4c 0001 0067 0000 0000 0012 696e 7374 616e 7469 6174 696f 6e5f 6c69 7374 0000 0000 000f 5640 0200 5c1f 0000 3287
2260140  0000 0008 0010 0a4c 0010 0a4c 0001 0063 0000 0000 000f 82e0 0200 4edf 0000 3287 0000 0008 0011 664c 0011 664c 0041 0000
2260220  0000 0000 2c78 0010 0002 438a 239c 0000 0011 33d0 0017 696e 7465 6765 725f 7479 7065 5f64 6566 696e 6974 696f 6e00 0000
2260300  000f 5670 0200 5c27 0000 3287 0000 0008 0011 4980 0011 4980 0001 0063 0000 0000 000d 6461 7461 7374 7275 6374 7572 6500
2260360  2c78 0010 0002 438a 239c 0000 0011 3010 001e 696e 7465 7266 6163 655f 636f 6e73 7461 6e74 5f64 6563 6c61 7261 7469 6f6e
2260440  0000 0000 0024 7075 7464 625f 696e 7465 7266 6163 655f 636f 6e73 7461 6e74 5f64 6563 6c61 7261 7469 6f6e 0000 000f 56a0
2260520  0200 5c2f 0000 3287 0000 0008 0010 0b38 0010 0b38 0001 0063 0000 0000 000a 6172 7261 7977 7269 7465 0000 0000 000f 56d0
2260600  0200 5c37 0000 3287 0000 0008 0011 7498 0011 7498 0001 0065 0000 0000 001c 696e 7465 7266 6163 655f 7369 676e 616c 5f64
2260660  6563 6c61 7261 7469 6f6e 0000 001e 696e 7465 7266 6163 655f 7661 7269 6162 6c65 5f64 6563 6c61 7261 7469 6f6e 0000 0000
2260740  0000 62d7 b328 0000 0011 e18c 0000 0000 000f 5700 0200 5c3f 0000 3287 0000 0008 0010 0e84 0010 0e84 0001 0063 0000 0000
2261020  000f 5730 0200 5c47 0000 3287 0000 0008 0010 11b0 0010 11b0 0001 0063 0000 0000 0011 696e 7465 7266 6163 655f 656c 656d
2261100  656e 7400 000f 5760 0200 5c4f 0000 3287 0000 0008 0011 4b04 0011 4b04 0001 0063 0000 0000 000c 7374 7269 6e67 5f63 6861
2261160  7273 0000 2c78 0010 0002 438a 239c 0000 0011 31d8 000b 6578 6973 7473 5f74 7970 6500 0000 27f0 0010 0010 0e20 239c 0000
2261240  0011 4ae4 0022 7075 7464 625f 696e 7465 7266 6163 655f 7369 676e 616c 5f64 6563 6c61 7261 7469 6f6e 0000 0000 0000 62d7
2261320  b328 4a70 0011 e1b8 0000 0000 0011 3e40 0300 5aef 0000 3287 0000 000c 000a 18f0 000a 18f0 0000 0000 0000 0000 000f 5790
2261400  0300 5c57 0000 3287 0000 000c 0011 7474 0011 7474 0001 0065 0000 0000 0024 7075 7464 625f 696e 7465 7266 6163 655f 7661
2261460  7269 6162 6c65 5f64 6563 6c61 7261 7469 6f6e 0000 2c78 0010 0002 438a 239c 0000 0012 3654 000f 57c0 0300 5c5f 0000 3287
2261540  0000 000c 000a 18f0 000a 18f0 0000 0000 0000 0000 0010 6974 6572 6174 696f 6e5f 7363 6865 6d65 0000 000f 57f0 0300 5c67
2261620  0000 3287 0000 000c 0011 4c6c 0011 4c6c 0001 0063 0000 0000 000d 7374 7269 6e67 5f73 6561 7263 6800 27f0 0024 0011 4c94
2261700  5d10 0000 0100 53cf 671c 5758 4b8c 0000 0000 53cf 6750 22bc 0011 2b50 2cac 0000 0002 438a 2ca0 0000 0000 0004 0000 0002
2261760  0011 4c48 0011 4c94 0002 438a 000a 3000 0000 0000 2954 0024 0002 438a 5d10 0000 0100 52bf 671c 5758 4b8c 0000 0000 52bf
2262040  6750 22bc 0011 4cc8 0011 41c8 0300 5b5f 0000 3287 0000 000c 000f e610 000f e610 0001 0063 0000 0000 000d 6578 6973 7473
2262120  5f69 6f6e 6f64 6500 2c78 0010 0002 438a 239c 0000 0011 15dc 000a 6c61 6265 6c5f 6c69 7374 0000 0000 000f 5820 0300 5c6f
2262200  0000 3287 0000 000c 0011 4d4c 0011 4d4c 0001 0063 0000 0000 000d 7072 6f63 626f 6479 5f6e 616d 6500 27f0 0014 0010 1480
2262260  56f8 671c 5370 22bc 0011 23f8 2cac 0000 0002 438a 2ca0 0000 0000 0000 0000 0000 0011 4d38 0010 1480 0010 f0dc 0011 4c90
2262340  000d 6765 7464 625f 6375 7272 656e 7400 2c78 0020 0002 438a 45b8 46ec 2ba0 0014 0008 2330 0011 4db0 2c58 2330 0011 4374
2262420  0011 1ddc 0200 5747 0000 3287 0000 0008 000a 18f0 000a 18f0 0000 0000 0000 0000 2c78 0010 0002 438a 320c 22bc 0012 11d8
2262500  2c78 0020 0002 438a 45b8 46ec 2ba0 0014 0008 2330 0011 34bc 2c58 2330 0011 3410 0011 6c6f 6769 6361 6c5f 6e61 6d65 5f6c
2262560  6973 7400 2c78 0010 0002 438a 239c 0000 0012 36d4 000f 5850 0200 5c77 0000 3287 0000 0008 0011 4fc0 0010 16c4 0001 0063
2262640  0000 0000 000c 7072 696d 6172 795f 756e 6974 0000 000e 7365 636f 6e64 6172 795f 756e 6974 0000 0000 000c 6c65 6761 6c5f
2262720  656e 7469 7479 0000 2c78 0020 0002 438a 2520 46ec 3310 247c 0011 4e98 0014 37f0 3cf4 234c 0011 4eb8 000f 5880 0200 5c7f
2263000  0000 3287 0000 0008 0011 58cc 0011 58cc 0001 0063 0000 0000 000f 58e0 0200 5c87 0000 3287 0000 0008 0011 5ee8 0011 5ee8
2263060  0001 0063 0000 0000 000f 6e75 6d65 7269 635f 6c69 7465 7261 6c00 0000 000e 7374 7269 6e67 5f6c 6974 6572 616c 0000 0000
2263140  0010 d5dc 0200 544f 0000 3287 0000 0008 0010 15f8 0010 15f8 0001 0063 0000 0000 0000 1e37 b328 0010 0013 33c4 0000 0000
2263220  000f 5910 0200 5c8f 0000 3287 0000 0008 0011 53f0 0011 53f0 0001 0063 0000 0000 000f 5940 0200 5c97 0000 3287 0000 0008
2263300  000a 18f0 000a 18f0 0000 0000 0000 0000 000c 6c6f 6769 6361 6c5f 6e61 6d65 0000 000f 59a0 0200 5c9f 0000 3287 0000 0008
2263360  0011 4fa0 0011 4fa0 0001 0063 0000 0000 2c78 0010 0002 438a 239c 0000 0012 3894 2c78 0010 0002 438a 239c 0000 0011 3b44
2263440  000c 696e 635f 6469 7374 616e 6365 0038 27f0 0010 0010 16c4 239c 0000 0011 4f80 0010 6c6f 6769 6361 6c5f 6f70 6572 6174
2263520  6f72 0000 000f 5a00 0200 5ca7 0000 3287 0000 0008 0010 1728 0010 1728 0001 0063 0000 0000 2c78 0010 0002 438a 239c 0000
2263600  0012 3a08 000e 6c6f 6f70 5f73 7461 7465 6d65 6e74 0000 0000 000e 7075 7464 625f 656e 645f 6c6f 6f70 0000 0000 000f 5a60
2263660  0200 5caf 0000 3287 0000 0008 000f da84 000f da84 0001 0063 0000 0000 000b 6368 696c 6472 656e 5f6f 6600 0000 000f 5ac0
2263740  0100 5cb7 0000 3287 0000 0004 0012 01ec 0012 01ec 0001 0067 0000 0000 000f 5b20 0000 5cbf 0000 3287 0000 0000 0012 0210
2264020  0012 0210 0001 0067 0000 0000 0016 6d69 7363 656c 6c61 6e65 6f75 735f 6f70 6572 6174 6f72 0000 0000 000f 5b80 0200 5cc7
2264100  0000 3287 0000 0008 000f dba4 000f dba4 0001 0063 0000 0000 000d 7072 6f63 626f 6479 5f74 7970 6500 0000 28e7 b328 0010
2264160  0012 aa04 0000 0000 0014 6d75 6c74 6970 6c79 696e 675f 6f70 6572 6174 6f72 0000 000f 5be0 0300 5ccf 0000 3287 0000 000c
2264240  000f dce4 000f dce4 0001 0063 0000 0000 000b 7072 6f63 626f 6479 5f69 6400 0000 000c 7072 6f63 6564 7572 655f 6964 0000
```

```
2264320 2c78 0024 0002 438a 45b8 46ec 4768 2ba0 0018 000a 23fc 0000 0011 1754 2c58 231c 0011 33a0 000e 76b8 646c 5f6e 616d 655f
2264400 6c69 7374 0000 0000 000f 5c40 0300 5cd7 0000 3287 0000 000c 0011 51dc 0011 51dc 0001 0063 0000 0000 000d 6578 6973 7473
2264460 5f65 6e74 6974 7900 27f0 0014 000f dd48 56f8 671c 5370 22bc 0011 144c 2cac 0000 0002 438a 2ca0 0000 0000 0000 0000 0000
2264540 0011 51c8 000f ddd8 0010 f0c4 0011 5200 0000 0000 000e 6e65 7874 5f73 7461 7465 6d65 6e74 0000 0000 0014 7075 7464 625f
2264620 6e65 7874 5f73 7461 7465 6d65 6e74 0000 000f 5c70 0200 5cdf 0000 3287 0000 0008 0011 52a0 000f dec0 0001 0063 0000 0000
2264700 000a 7375 6363 6573 736f 7273 0000 0000 2938 0020 000f de40 56f8 4af8 0000 297f 55f0 4af8 0000 0ddf 6b88 22bc 0011 5290
2264760 000f 5ca0 0000 5ce7 0000 3287 0000 0000 0011 7450 0011 7450 0001 0065 0000 0000 27f0 0000 000f de40 2ca0 0000 0000 0000
2265040 0000 0000 0011 5260 000f de40 0011 526a 0011 52c4 0000 0000 0011 5280 0100 5ce7 0000 3287 0000 0004 0011 be7c 0011 be7c
2265120 0001 0065 0000 0000 0011 52c8 0200 5ce7 0000 3287 0000 0008 0011 bebc 0011 bebc 0001 0065 0000 0000 000e 6e75 6c6c 5f73
2265200 7461 7465 6d65 6e74 0000 0000 0014 7075 7464 625f 6e75 6c6c 5f73 7461 7465 6d65 6e74 0000 000f 5cd0 0200 5cef 0000 3287
2265260 0000 0008 0011 53a4 0011 53a4 0001 0063 0000 0000 2c78 0010 0002 438a 239c 0000 0012 08d8 2c78 0020 0002 438a 56f8 4af8
2265340 0000 5307 55f0 4af8 0000 01df 6b88 22bc 0011 5394 000c 087c 0000 5cf7 0000 3287 0000 0000 000a 18f0 000a 18f0 0000 0000
2265420 0000 0000 2cac 0000 0002 438a 2ca0 0000 0000 0000 0000 0000 0011 5364 0011 5364 0011 536e 0011 53c8 0000 0000 0010 7068
2265500 7973 6963 616c 5f6c 6974 6572 616c 0000 000c 7072 6564 6563 6573 736f 7273 0000 2c78 0020 0002 438a 45b8 46ec 2ba0 0014
2265560 0008 2330 0011 12f8 2c58 2330 0011 5420 000e 8130 0200 5cff 0000 3287 0000 0008 000f e690 000f e690 0001 0063 0000 0000
2265640 0014 7661 7269 6162 6c65 5f64 6563 6c61 7261 7469 6f6e 0000 0000 6a47 b328 0010 0012 a968 0000 0000 000e 81e4 0200 5d07
2265720 0000 3287 0000 0008 000f 9c4c 000f 9c4c 0001 0063 0000 0000 000b 636f 6e73 7461 6e74 5f69 6400 0000 2c78 0010 0002 438a
2266000 239c 0000 0011 54a8 0011 4f40 0300 5c97 0000 3287 0000 000c 000d bce4 000d bce4 0001 0063 0000 0000 2c78 0010 0002 438a
2266060 239c 0000 0012 3a80 000c 7061 636b 6167 655f 626f 6479 0000 001d 7061 636b 6167 655f 626f 6479 5f64 6563 6c61 7261 7469
2266140 7665 5f70 6172 7400 000e 8204 0200 5d0f 0000 3287 0000 0008 000f e0f0 000f e0f0 0001 0063 0000 0000 000a 6172 7261 795f
2266220 7479 7065 0000 0000 000e 8258 0200 5d17 0000 3287 0000 0008 0010 f0b8 0011 55a8 0001 0063 0000 0000 001d 7061 636b 6167
2266300 655f 626f 6479 5f64 6563 6c61 7261 7469 7665 5f69 7465 6d00 000e 8278 0200 5d1f 0000 3287 0000 0008 000f e244 000f e244
2266360 0001 0063 0000 0000 000b 6465 636c 6172 6564 5f69 6e00 0000 000d 6375 7272 656e 745f 7374 6174 6500 2954 0020 0002 438a
2266440 2520 46ec 3310 247c 0011 5578 0014 37f0 3cf4 234c 0011 5538 0018 7061 636b 6167 655f 6465 636c 6172 6174 6976 655f 7061
2266520 7274 0000 2c78 0010 0002 438a 320c 22bc 0011 48bc 000e 82bc 0200 5d27 0000 3287 0000 0008 0010 f0ac 0011 5670 0001 0063
2266600 0000 0000 0018 7061 636b 6167 655f 6465 636c 6172 6174 6976 655f 6974 656d 0000 000e 82dc 0200 5d2f 0000 3287 0000 0008
2266660 000f e4d0 000f e4d0 0001 0063 0000 0000 2c78 0010 0002 438a 239c 0000 0012 0fe4 27f0 000e 0011 d67c 48f8 5548 2edc 0000
2266740 2954 0020 0002 438a 2520 46ec 3310 247c 0011 5640 0014 37f0 3cf4 234c 0011 5604 0012 346c 0100 4ed7 0000 3287 0000 0004
2267020 0011 66f0 0011 66f0 0041 0000 0000 0000 0018 7068 7973 6963 616c 5f74 7970 655f 6465 6669 6e69 7469 6f6e 0000 001f 7365
2267100 636f 6e64 6172 795f 756e 6974 5f64 6563 6c61 7261 7469 6f6e 5f6c 6973 7400 0000 000e 836c 0200 5d3f 0000 3287 0000 0008
2267160 000f e700 000f e700 0001 0063 0000 0000 0000 6a3f b328 0010 0012 a934 0000 0000 0011 1c34 0200 5717 0000 3287 0000 0008
2267240 000a 18f0 000a 18f0 0000 0000 0000 0000 000e 8180 0200 5d47 0000 3287 0000 0008 0011 5f58 0011 5f64 0001 0063 0000 0000
2267320 000d 6f70 6572 6174 6f72 5f74 7970 6500 000e 84c0 0200 5d4f 0000 3287 0000 0008 0011 57b8 0011 57b8 0001 0063 0000 0000
2267400 0013 706f 7274 5f69 6e74 6572 6661 6365 5f6c 6973 7400 0000 000d 6272 616e 6368 5f69 6e70 7574 7300 2c78 0010 0002 438a
2267460 239c 0000 0011 57d8 000c 0c54 0200 5d57 0000 3287 0000 0008 0011 581c 000f e95c 0001 0063 0000 0000 0021 706f 7274 5f69
2267540 6e74 6572 6661 6365 5f73 6967 6e61 6c5f 6465 636c 6172 6174 696f 6e00 2c78 0010 0002 438a 239c 0000 0012 10d0 27f0 0010
2267620 000f e95c 239c 0000 0011 583c 0008 db0c 0200 5d5f 0000 3287 0000 0008 000f e9ec 000f e9ec 0001 0063 0000 0000 000c 7075
2267700 7464 625f 6272 616e 6368 0000 0008 b28c 0300 5467 0000 3287 0000 000c 0011 7468 0011 7468 0001 0065 0000 0000 000d 6f70
2267760 6572 6174 6f72 5f63 616c 6c00 000d 7661 7269 6162 6c65 5f6e 616d 6500 2c78 0010 0002 438a 239c 0000 0011 144c 000b 7661
2270040 7269 6162 6c65 5f69 6400 0000 000d 7573 6564 5f76 6172 6961 626c 6500 2c78 0010 0002 438a 239c 0000 0011 31f8 000f 6c65
2270120 6761 6c5f 7072 6f63 6564 7572 6500 0000 0014 7075 7464 625f 7072 6f63 6564 7572 655f 6361 6c6c 0000 000a 33d9 0011 d0e4
2270200 0000 0000 0011 d12c 000c 0ca4 0200 5d6f 0000 3287 0000 0008 0011 7414 0011 7414 0001 0065 0000 0000 000c 0cfc 0100 5d77
2270260 0000 3287 0000 0004 0011 bee0 0011 bee0 0001 0065 0000 0000 0018 7072 6f63 6573 735f 6465 636c 6172 6174 6976 655f 6974
2270340 656d 0000 000c 01b0 0200 5d87 0000 3287 0000 0008 0011 59a4 0011 59a4 0001 0063 0000 0000 2c78 0010 0002 438a 239c 0000
2270420 000f 8660 2c78 0010 0002 438a 239c 0000 0011 5468 0018 7072 6f63 6573 735f 6465 636c 6172 6174 6976 655f 7061 7274 0000
2270500 000c 0f74 0200 5d8f 0000 3287 0000 0008 0011 5a00 0011 5a0c 0001 0063 0000 0000 2c78 0010 0002 438a 239c 0000 000f 8640
2270560 27f0 000c 0011 5a0c 48b0 7220 2954 0020 0002 438a 2520 46ec 3310 247c 0011 5984 0014 37f0 3cf4 234c 0011 59e0 0010 7365
2270640 6e73 6974 6976 6974 795f 6c69 7374 0000 0017 7075 7464 625f 7072 6f63 6573 735f 7374 6174 656d 656e 7400 0000 0016 7072
2270720 6f63 6573 735f 7374 6174 656d 656e 745f 7061 7274 0000 0000 001b 7075 7464 625f 656e 645f 7072 6f63 6573 735f 7374 6174
2271000 656d 656e 7400 0000 2c78 0010 0002 438a 239c 0000 000f 8608 000c 11bc 0200 5d97 0000 3287 0000 0008 0011 6074 000d b378
2271060 0001 0063 0000 0000 000c 12a4 0000 5d9f 0000 3287 0000 0000 0011 c3a0 0011 c3a0 0001 0067 0000 0000 0008 b3ac 0200 5da7
2271140 0000 3287 0000 0008 0011 5b39 0011 5b5c 0001 0063 0000 0000 0008 acac 0000 5daf 0000 3287 0000 0000 0011 c450 0011 c450
2271220 0001 0067 0000 0000 000d 696f 6e6f 6465 5f6e 756d 6265 7200 27f0 000c 0011 5b5c 48b0 7220 0014 7365 7175 656e 7469 616c
2271300 5f73 7461 7465 6165 6e74 0000 2954 0020 0002 438a 2520 46ec 3310 247c 0011 5b8c 0014 37f0 3cf4 234c 0011 5af8 0008 acec
2271360 0200 5db7 0000 3287 0000 0008 000d b418 000d b418 0001 0063 0000 0000 2c78 0010 0002 438a 239c 0000 000f 85d0 000b 6368
```

```
2271440 6563 6b5f 7261 6e67 6500 0000 0000 6077 29c8 0000 0011 73e4 0011 cdf0 0010 1ce8 0300 5dbf 0000 3287 0000 000c 0011 74ec
2271520 0011 74ec 0001 0065 0000 0000 000c 696f 6e6f 6465 5f76 616c 7565 0000 0011 34e0 0200 3f5f 0000 3287 0000 0008 000a 18f0
2271600 000a 18f0 0000 0000 0000 0000 2cac 0000 0002 438a 2ca0 0000 0000 0000 0000 0000 000f f2c4 000f f2c4 000f f2ce 0011 5c40
2271660 0000 0000 000d 636f 6e73 7461 6e74 5f6e 6164 6500 000b 6973 5f63 6f6e 7374 616e 7400 0000 27f0 0010 000f f450 239c 0000
2271740 0011 2708 0013 7265 6c61 7469 6f6e 616c 5f6f 7065 7261 746f 7200 0000 ffff ffff 0300 5dc7 0000 3287 0000 000c 000f f4e0
2272020 000f f4e0 0001 0063 0000 0000 000b 6973 5f76 6172 6961 626c 6500 0000 0000 5ecf 29c8 0000 0011 73cc 0011 cd70 2cac 0000
2272100 0002 438a 2ca0 0000 0000 0000 0000 0001 000f f638 000f f678 0002 438a 0011 5cf0 0011 5d00 2b24 0000 0002 438a 000f f688
2272160 0300 5ac7 29c8 0000 0011 5cf4 000f f648 000b 696f 6e6f 6465 5f6e 616d 6500 0000 2cac 0000 0002 438a 2ca0 0000 0000 0000
2272240 0000 0001 000f f6f0 000f f730 0002 438a 0011 5344 0011 5d54 2b24 0000 0002 438a 000f f740 0300 5ac7 29c8 0000 0011 5d48
2272320 000f f700 2c78 0010 0002 438a 239c 0000 000f 8598 2cac 0000 0002 438a 2ca0 0000 0000 0000 0000 0001 0010 6a18 000d b044
2272400 0002 438a 0011 5d98 0011 5da8 2b24 0000 0002 438a 000d b054 0300 5ac7 29c8 0000 0011 5d9c 0010 6a28 0016 7075 7464 625f
2272460 7265 7475 726e 5f73 7461 7465 6165 6e74 0000 0000 0008 dc2c 0200 5dcf 0000 3287 0000 0008 0011 5e44 0010 96c8 0001 0063
2272540 0000 0000 000c 7375 7464 625f 696f 6e6f 6465 0000 2938 0020 0010 96c8 56f8 4af8 0000 536f 55f0 4af8 0000 0ddf 6b88 22bc
2272620 0011 5e34 ffff ffff 0000 5dd7 0000 3287 0000 0000 000a 18f0 000a 18f0 0000 0000 0000 0000 27f0 0000 0010 96c8 2ca0 0000
2272700 0000 0000 0000 0000 0011 5e04 0010 96c8 0011 5e0e 0011 5e68 0000 0000 0011 5e24 0100 5dd7 0000 3287 0000 0004 000a 18f0
2272760 000a 18f0 0000 0000 0000 0000 0016 7363 616c 6172 5f74 7970 655f 6465 6669 6e69 7469 6f6e 0000 0000 0008 dc4c 0200 5ddf
2273040 0000 3287 0000 0008 0010 9598 0010 9598 0001 0063 0000 0000 000b 696f 6e6f 6465 5f74 7970 6500 0000 000a 6e65 775f 696f
2273120 6e6f 6465 0000 0000 2c78 0010 0002 438a 239c 0000 0011 16d4 001a 7365 636f 6e64 6172 795f 756e 6974 5f64 6563 6c61 7261
2273200 7469 6f6e 0000 0000 0008 b3ec 0200 5de7 0000 3287 0000 0008 000d b114 000d b114 0001 0063 0000 0000 27f0 0010 0011 cc9c
2273260 5548 5598 0018 2edc 2c78 0010 0002 438a 239c 0000 000f 8558 27f0 000c 0011 5f64 48b0 7220 2954 0020 0002 438a 2520 46ec
2273340 3310 247c 0011 5f28 0014 37f0 3cf4 234c 0011 5750 0012 7365 6c65 6374 6564 5f77 6176 6566 6f72 6d73 0000 0000 2c78 0010
2273420 0002 438a 239c 0000 000f 8520 0010 a65c 0200 5def 0000 3287 0000 0008 000d b298 000d b2c4 0001 0063 0000 0000 000b 6f70
2273500 6572 6174 6f72 5f69 6400 0000 0012 7365 6e73 6974 6976 6974 795f 636c 6175 7365 0000 0000 0008 b48c 0200 5df7 0000 3287
2273560 0000 0008 0011 603c 0011 603c 0001 0063 0000 0000 000c 6e65 775f 6f70 6572 6174 6f72 0000 2c78 0018 0002 438a 56f8 4af8
2273640 0000 2aa7 671c 22bc 0011 5ab8 2cac 0000 0002 438a 2ca0 0000 0000 0000 0000 0000 0011 6024 0011 6024 0011 602e 0011 6060
2273720 0000 0000 2c78 0010 0002 438a 239c 0000 000f 84e0 27f0 0014 000d b378 3640 35c8 31f0 22bc 0011 144c 2c78 0010 0002 438a
2274000 239c 0000 000f 84c0 27f0 000c 0011 60a4 48b0 7220 2954 0020 0002 438a 2520 46ec 3310 247c 0011 5b8c 0014 37f0 3cf4 234c
2274060 0011 25e8 001d 7661 7269 6162 6c65 5f61 7373 6967 6e6d 656e 745f 7374 6174 656d 656e 7400 001b 7369 676e 616c 5f61 7373
2274140 6957 6e6d 656e 745f 7374 6174 656d 656e 7400 0000 2c78 0010 0002 438a 239c 0000 000f 8480 000b 43a0 0200 5dff 0000 3287
2274220 0000 0008 000f 792c 000f 792c 0001 0063 0000 0000 000f d220 0200 5e07 0000 3287 0000 0008 000d b548 000d b5c4 0001 0063
2274300 0000 0000 0009 7669 646c 5f73 6967 6e00 000f d250 0200 5e0f 0000 3287 0000 0008 000d b4e0 000d b4e0 0001 0063 0000 0000
2274360 2c78 0010 0002 438a 239c 0000 000f 8460 0017 7375 7464 625f 7369 676e 616c 5f61 7373 6967 6e6d 656e 7400 0000 2c78 0010
2274440 0002 438a 239c 0000 000f 8420 0011 2cf8 0300 5927 0000 3287 0000 000c 0011 696c 0011 696c 0001 0063 0000 0000 000f d280
2274520 0200 5e17 0000 3287 0000 0008 0011 742c 0011 742c 0001 0065 0000 0000 000b 7369 676e 616c 5f6b 696e 6400 0000 0018 7075
2274600 7464 625f 7369 676e 616c 5f64 6563 6c61 7261 7469 6f6e 0000 000a 7768 696c 655f 6c6f 6f70 0000 0000 000f d2b0 0300 5e1f
2274660 0000 3287 0000 000c 000d ba70 000d ba70 0001 0063 0000 0000 000f d2e0 0300 5e27 0000 3287 0000 000c 0011 79a8 0011 79f8
2274740 0001 0065 0000 0000 000a 7072 6f63 6573 7369 6e67 0000 0000 000d 7374 6174 6562 6c6f 636b 5f69 6400 001b 7369 6d70 6c65
2275020 5f65 7870 7265 7373 696f 6e5f 7361 6e73 5f73 6967 6e00 0000 000b 696f 6e6f 6465 5f62 6974 7300 0000 27f0 0010 0011 62f8
2275100 239c 0000 0011 62e8 000f d310 0300 5e2f 0000 3287 0000 000c 0011 632c 000d bba8 0001 0063 0000 0000 2954 0024 0002 438a
2275160 45b8 3574 4768 332c 2430 0000 0011 6170 0018 396c 3430 2340 0011 62e8 000c 0965 6e64 2070 726f 6365 7373 0000 27f0 0010
2275240 000d bba8 239c 0000 0011 634c 0010 1b28 0300 337f 0300 3287 0000 000c 0011 66ac 000d c660 0001 0063 0000 0000 000d 7075
2275320 7464 625f 7072 6f63 6573 7300 2c78 0010 0002 438a 239c 0000 0011 15dc 000a 736c 6963 655f 6e61 6d65 0000 0000 000f d340
2275400 0200 5e37 0000 3287 0000 0008 000d bc70 0001 bc70 0001 0063 0000 0000 2c78 0010 0002 438a 239c 0000 000f 83e0 0011 1b14
2275460 0200 56f7 0000 3287 0000 0008 000a 18f0 000a 18f0 0000 0000 0000 0000 2c78 0010 0002 438a 239c 0000 000f 83a8 0011 43c0
2275540 0300 5b8f 0000 3287 0000 000c 000a 18f0 000a 18f0 0000 0000 0000 0000 0018 7375 6270 726f 6772 616d 5f73 7065 6369 6669
2275620 6361 7469 6f6e 0000 001b 7375 6270 726f 6772 616d 5f64 6563 6c61 7261 7469 7665 5f70 6172 7400 0000 0019 7375 6270 726f
2275700 6772 616d 5f73 7461 7465 6d65 6e74 5f70 6172 7400 2c78 0010 0002 438a 239c 0000 000f 8368 000f d370 0300 5e3f 0000 3287
2275760 0000 000c 000d bf48 000d bf48 0001 0063 0000 0000 000f d3a0 0200 5e47 0000 3287 0000 0008 0011 6558 0011 6564 0001 0063
2276040 0000 0000 000f d3d0 0200 5e4f 0000 3287 0000 0008 0011 65a4 0011 65b0 0001 0063 0000 0000 000d 6164 6463 6c61 7573 6573
2276120 2e70 6c00 2c78 0014 0002 438a 3640 35c8 31f0 22bc 0011 6484 001b 7375 6270 726f 6772 616d 5f64 6563 6c61 7261 7469 7665
2276200 5f69 7465 6d00 0000 000f d400 0200 5e57 0000 3287 0000 0008 000d be4c 000d be4c 0001 0063 0000 0000 0000 5f3f b328 0000
2276260 0011 9524 0000 0000 0000 5f4f b328 0000 0011 bf2c 0000 0000 27f0 000c 0011 6564 48b0 7220 2954 0020 0002 438a 2520 46ec
2276340 3310 247c 0011 6528 0014 37f0 3cf4 234c 0011 64a4 0000 5f4f b328 0000 0011 bf58 0000 0000 0000 5f3f b328 64d4 0011 9550
2276420 0000 0000 27f0 000c 0011 65b0 48b0 7220 2954 0020 0002 438a 2520 46ec 3310 247c 0011 5b8c 0014 37f0 3cf4 234c 0011 64c4
2276500 2c78 0010 0002 438a 239c 0000 000f 8328 000d 7075 7464 625f 6375 7272 656e 7400 28c4 0020 0011 6610 2520 4754 33a0 247c
```

1701

1702

```
2276560 0011 144c 0014 37f0 3cf4 234c 0011 2fc0 2954 0010 0002 438a 239c 0000 0011 144c 0006 7375 6666 6978 0000 0000 000f d430
2276640 0300 5e5f 0000 3287 0000 000c 000d c594 000d c594 0001 0063 0000 0000 2c78 0010 0002 438a 239c 0000 000f 82f0 0011 2650
2276720 0300 5867 0000 3287 0000 000c 000a 18f0 000a 18f0 0000 0000 0000 0000 000a 6e65 775f 656e 7469 7479 0000 0000 2c78 0010
2277000 0002 438a 239c 0000 0011 144c 000c 7075 7464 625f 656e 7469 7479 0000 27f0 0010 000d c660 239c 0000 0011 3ddc 000e 7469
2277060 6365 6f75 745f 636c 6175 7365 0000 0000 000f d460 0200 5e67 0000 3287 0000 0008 0011 6718 0011 6718 0001 0063 0000 0000
2277140 2c78 0010 0002 438a 239c 0000 000f 82b8 2c78 0018 0002 438a 56f8 4af8 0000 52bf 671c 22bc 0011 199c 2cac 0000 0002 438a
2277220 2ca0 0000 0000 0000 0000 0000 0011 6700 0011 6700 0011 670a 0011 673c 0000 0000 000f 7479 7065 5f63 6f6e 7665 7273 696f
2277300 6e00 0000 000f d490 0200 5e6f 0000 3287 0000 0008 000d c728 000d c728 0001 0063 0000 0000 000b 6e65 775f 7072 6f63 6573
2277360 7300 d191 2954 0010 0002 438a 239c 0000 000e 7450 2c78 0020 0002 438a 45b8 46ec 2ba0 0014 0008 2330 0011 40b8 2c58 2330
2277440 0011 4750 000b 636f 756e 7465 7273 2e70 6c00 0000 000d 6765 6e65 7269 635f 7574 696c 7300 000a 6164 6463 6c61 7573 6573
2277520 0000 0000 0012 7365 6c65 6374 6564 5f6e 616d 655f 6c69 7374 0000 0000 2954 0010 0002 438a 239c 0000 000e 72e0 000f d4c0
2277600 0200 5e77 0000 3287 0000 0008 000a 18f0 000a 18f0 0000 0000 0000 0000 0000 5f2f b328 0000 0011 7634 0000 0000 27f0 000c
2277660 0011 684d 48b0 7220 2954 0020 0002 438a 2520 46ec 3310 247c 0011 22a0 0014 37f0 3cf4 234c 0011 2008 0019 7075 7464 625f
2277740 7661 7269 6162 6c65 5f61 7373 6967 6e6d 656e 7400 0000 5f2f b328 0000 000d 84b4 0000 0000 000f d4f0 0200 5e7f 0000 3287
2300020 0000 0008 0011 c804 0011 c804 0001 0067 0000 0000 c01a 7075 7464 625f 7661 7269 6162 6c65 5f64 6563 6c61 7261 7469 6f6e
2300100 0000 0000 000c 636e 7465 7261 6564 6961 7465 0000 000f d520 0200 5e87 0000 3287 0000 0008 0012 026c 0012 026c 0001 0067
2300160 0000 0000 000e 7761 6974 5f73 7461 7465 6d65 6e74 0000 0000 000f d550 0200 5e8f 0000 3287 0000 0008 000f 9e58 000f 9e58
2300240 0001 0063 0000 0000 000a 7374 6174 6562 6c6f 636b 0000 0000 0010 7761 7665 666f 726d 5f65 6c65 6d65 6e74 0000 0000 5eb7
2300320 b328 0000 0010 f3c8 0000 0000 2c78 0010 0002 438a 239c 0000 0011 698c 000f d580 0300 5e97 0000 3287 0000 000c 0011 69ac
2300400 0011 69ac 0001 0063 0000 0000 0000 5eb7 b328 0000 0010 f39c 0000 0000 2c78 0010 0002 438a 239c 0000 0011 142c 0010 6e65
2300460 775f 6172 6368 6974 6563 7475 7265 0044 0011 6ee4 0000 0504 0011 69dc 0011 69ec 0000 000c 0011 69e8 0011 69f8 0000 000c
2300540 0011 69f4 0011 6a04 0000 000c 0011 6a00 0011 6a10 0000 000c 0011 6a0c 0011 6a1c 0000 000c 0011 6a18 0011 6a28 0000 000c
2300620 0011 6a24 0011 6a34 0000 000c 0011 6a30 0011 6a40 0000 000c 0011 6a3c 0011 6a4c 0000 000c 0011 6a48 0011 6a58 0000 000c
2300700 0011 6a54 0011 6a64 0000 000c 0011 6a60 0011 6a70 0000 000c 0011 6a6c 0011 6a7c 0000 000c 0011 6a78 0011 6a88 0000 000c
2300760 0011 6a84 0011 6a94 0000 000c 0011 6a90 0011 6aa0 0000 000c 0011 6a9c 0011 6aac 0000 000c 0011 6aa8 0011 6ab8 0000 000c
2301040 0011 6ab4 0011 6ac4 0000 000c 0011 6ac0 0011 6ad0 0000 000c 0011 6acc 0011 6adc 0000 000c 0011 6ad8 0011 6ae8 0000 000c
2301120 0011 6ae4 0011 6af4 0000 000c 0011 6af0 0011 6b00 0000 000c 0011 6afc 0011 6b0c 0000 000c 0011 6b08 0011 6b18 0000 000c
2301200 0011 6b14 0011 6b24 0000 000c 0011 6b20 0011 6b30 0000 000c 0011 6b2c 0011 6b3c 0000 000c 0011 6b38 0011 6b48 0000 000c
2301260 0011 6b44 0011 6b54 0000 000c 0011 6b50 0011 6b60 0000 000c 0011 6b5c 0011 6b6c 0000 000c 0011 6b68 0011 6b78 0000 000c
2301340 0011 6b74 0011 6b84 0000 000c 0011 6b80 0011 6b90 0000 000c 0011 6b8c 0011 6b9c 0000 000c 0011 6b98 0011 6ba8 0000 000c
2301420 0011 6ba4 0011 6bb4 0000 000c 0011 6bb0 0011 6bc0 0000 000c 0011 6bbc 0011 6bcc 0000 000c 0011 6bc8 0011 6bd8 0000 000c
2301500 0011 6bd4 0011 6be4 0000 000c 0011 6be0 0011 6bf0 0000 000c 0011 6bec 0011 6bfc 0000 000c 0011 6bf8 0011 6c08 0000 000c
2301560 0011 6c04 0011 6c14 0000 000c 0011 6c10 0011 6c20 0000 000c 0011 6c1c 0011 6c2c 0000 000c 0011 6c28 0011 6c38 0000 000c
2301640 0011 6c34 0011 6c44 0000 000c 0011 6c40 0011 6c50 0000 000c 0011 6c4c 0011 6c5c 0000 000c 0011 6c58 0011 6c68 0000 000c
2301720 0011 6c64 0011 6c74 0000 000c 0011 6c70 0011 6c80 0000 000c 0011 6c7c 0011 6c8c 0000 000c 0011 6c88 0011 6c98 0000 000c
2302000 0011 6c94 0011 6ca4 0000 000c 0011 6ca0 0011 6cb0 0000 000c 0011 6cac 0011 6cbc 0000 000c 0011 6cb8 0011 6cc8 0000 000c
2302060 0011 6cc4 0011 6cd4 0000 000c 0011 6cd0 0011 6ce0 0000 000c 0011 6cdc 0011 6cec 0000 000c 0011 6ce8 0011 6cf8 0000 000c
2302140 0011 6cf4 0011 6d04 0000 000c 0011 6d00 0011 6d10 0000 000c 0011 6d0c 0011 6d1c 0000 000c 0011 6d18 0011 6d28 0000 000c
2302220 0011 6d24 0011 6d34 0000 000c 0011 6d30 0011 6d40 0000 000c 0011 6d3c 0011 6d4c 0000 000c 0011 6d48 0011 6d58 0000 000c
2302300 0011 6d54 0011 6d64 0000 000c 0011 6d60 0011 6d70 0000 000c 0011 6d6c 0011 6d7c 0000 000c 0011 6d78 0011 6d88 0000 000c
2302360 0011 6d84 0011 6d94 0000 000c 0011 6d90 0011 6da0 0000 000c 0011 6d9c 0011 6dac 0000 000c 0011 6da8 0011 6db8 0000 000c
2302440 0011 6db4 0011 6dc4 0000 000c 0011 6dc0 0011 6dd0 0000 000c 0011 6dcc 0011 6ddc 0000 000c 0011 6dd8 0011 6de8 0000 000c
2302520 0011 6de4 0011 6df4 0000 000c 0011 6df0 0011 6e00 0000 000c 0011 6dfc 0011 6e0c 0000 000c 0011 6e08 0011 6e18 0000 000c
2302600 0011 6e14 0011 6e24 0000 000c 0011 6e20 0011 6e30 0000 000c 0011 6e2c 0011 6e3c 0000 000c 0011 6e38 0011 6e48 0000 000c
2302660 0011 6e44 0011 6e54 0000 000c 0011 6e50 0011 6e60 0000 000c 0011 6e5c 0011 6e6c 0000 000c 0011 6e68 0011 6e78 0000 000c
2302740 0011 6e74 0011 6e84 0000 000c 0011 6e80 0011 6e90 0000 000c 0011 6e8c 0011 6e9c 0000 000c 0011 6e98 0011 6ea8 0000 000c
2303020 0011 6ea4 0011 6eb4 0000 000c 0011 6eb0 0011 6ec0 0000 000c 0011 6ebc 0011 6ecc 0000 000c 0011 6ec8 0011 6ee4 0000 000c
2303100 0011 6ed4 29c8 d51c 0010 44b8 0013 fc12 0011 7118 0000 0180 0011 6ed4 0011 6efc 0000 000c 0011 6ee0 0011 6f08 0000 000c
2303160 0011 6eec 0011 6f14 0000 000c 0011 6ef8 0011 6f20 0000 000c 0011 6f04 0011 6f2c 0000 000c 0011 6f10 0011 6f38 0000 000c
2303240 0011 6f1c 0011 6f44 0000 000c 0011 6f28 0011 6f50 0000 000c 0011 6f34 0011 6f5c 0000 000c 0011 6f40 0011 6f68 0000 000c
2303320 0011 6f4c 0011 6f74 0000 000c 0011 6f58 0011 6f80 0000 000c 0011 6f64 0011 6f8c 0000 000c 0011 6f70 0011 6f98 0000 000c
2303400 0011 6f7c 0011 6fa4 0000 000c 0011 6f88 0011 6fb0 0000 000c 0011 6f94 0011 6fbc 0000 000c 0011 6fa0 0011 6fc8 0000 000c
2303460 0011 6fac 0011 6fd4 0000 000c 0011 6fb8 0011 6fe0 0000 000c 0011 6fc4 0011 6fec 0000 000c 0011 6fd0 0011 6ff8 0000 000c
2303540 0011 6fdc 0011 7004 0000 000c 0011 6fe8 0011 7010 0000 000c 0011 6ff4 0011 701c 0000 000c 0011 7000 0011 7028 0000 000c
2303620 0011 700c 0011 7034 0000 000c 0011 7018 0011 7040 0000 000c 0011 7024 0011 704c 0000 000c 0011 7030 0011 7058 0000 000c
```

```
2303700 0011 703c 0011 7094 0000 000c 0011 7048 0008 7574 696c 732e 706c 0000 0008 6461 7461 6261 7365 0060 0007 616c 6961 7365
2303760 7300 706c 0009 7375 6363 6573 736f 7200 000f 7072 6f63 626f 6479 5f61 6e64 5f69 6400 000c 000b 6675 6e63 7469 6f6e 5f69
2304040 6400 0000 0006 696f 6e6f 6465 0011 70a8 2cac 7094 0002 438a 2ca0 0000 0000 0000 0000 0001 0012 79dc 000b 3bd4 000b 3bde
2304120 0012 7338 0008 7479 7065 5f6c 6f77 00d8 0009 7479 7065 5f68 6967 6800 0009 636f 6e73 7461 6e74 7300 0007 636f 6e74 726f
2304200 6c00 70fc 0011 7334 0000 01f8 0011 7090 0011 7130 0000 000c 0011 712c 0011 713c 0000 000c 0011 7138 0011 7148 0000 000c
2304260 0011 7144 0011 7154 0000 000c 0011 7330 0011 7160 0000 000c 0011 733c 0011 716c 0000 000c 0011 7168 0011 7178 0000 000c
2304340 0011 7174 0011 7184 0000 000c 0011 7180 0011 7190 0000 000c 0011 718c 0011 719c 0000 000c 0011 7198 0011 71a8 0000 000c
2304420 0011 7348 0011 71b4 0000 000c 0011 7354 0011 71c0 0000 000c 0011 736c 0011 71cc 0000 000c 0011 71c8 0011 71d8 0000 000c
2304500 0011 7408 0011 71e4 0000 000c 0011 71e0 0011 71f0 0000 000c 0011 71ec 0011 71fc 0000 000c 0011 71f8 0011 7208 0000 000c
2304560 0011 7204 0011 7214 0000 000c 0011 7210 0011 7220 0000 000c 0011 721c 0011 722c 0000 000c 0011 7228 0011 7238 0000 000c
2304640 0011 7234 0011 7244 0000 000c 0011 7240 0011 7250 0000 000c 0011 724c 0011 725c 0000 000c 0011 7258 0011 7268 0000 000c
2304720 0011 73c0 0011 7274 0000 000c 0011 7270 0011 7280 0000 000c 0011 727c 0011 728c 0000 000c 0011 7288 0011 7298 0000 000c
2305000 0011 7294 0011 72a4 0000 000c 0011 73a8 0011 72b0 0000 000c 0011 72ac 0011 72bc 0000 000c 0011 739c 0011 72c8 0000 000c
2305060 0011 72c4 0011 72d4 0000 000c 0011 72d0 0011 72e0 0000 000c 0011 72dc 0011 72ec 0000 000c 0011 72e8 0011 72f8 0000 000c
2305140 0011 72f4 0011 7304 0000 000c 0011 7390 0011 731c 0000 000c 0011 7054 0006 7061 7265 6e74 0011 7318 b464 4a3c 0013 ee68
2305220 000d 4138 0009 6368 696c 645f 6f66 0030 0011 7514 0000 0030 0011 7150 0011 734c 0000 000c 0011 715c 0011 7358 0000 000c
2305300 0011 71a4 0011 7370 0000 000c 0011 71b0 0009 7061 7265 6e74 5f6f 6600 b464 4a24 0013 e130 0000 0000 0009 6e65 775f 636f
2305360 756e 7400 0008 0970 726f 6365 7373 0000 2c78 0024 0002 438a 36f4 0018 447c 0000 0400 630f 6c48 0018 6b88 6bc8 6c08 22bc
2305440 0012 0c40 0007 7761 726e 696e 6700 73a8 0008 7265 636f 7665 6462 0064 2b24 73dc 0002 438a 0011 cdb4 0009 6973 5f69 6f6e
2305520 6f64 6500 2b24 73f4 0002 438a 0011 ce98 0009 6172 7261 7972 6561 6400 2c78 000a 0002 438a 228c 73f0 b464 73c4 000a 2a00
2305600 000d 4b64 2c78 000a 0002 438a 228c 7420 2c78 000a 0002 438a 228c 742c 2c78 000a 0002 438a 228c 7438 0007 7661 7373 6967
2305660 6e00 0000 0009 696f 6e6f 6465 5f69 6400 2c78 000a 0002 438a 228c 745c 2c78 000a 0002 438a 228c 7468 2c78 000a 0002 438a
2305740 228c 7474 2c78 000a 0002 438a 228c 7480 0009 6272 616e 6368 5f69 6400 2c78 000a 0002 438a 228c 7480 2c78 000a 0002 438a
2306020 228c 74ec 0009 7365 745f 636f 756e 7400 0006 6465 7369 676e 0011 74bc 0006 6272 616e 6368 0011 74c8 0008 7072 6f63 626f
2306100 6479 00d4 0006 6f75 7470 7574 0011 74e0 0008 6f70 6572 6174 6f72 00ec 2c78 000a 0002 438a 228c 748c 0008 636f 756e 7465
2306160 7273 0004 0007 7668 646c 2e70 6c00 7510 0011 77f8 0000 002c b288 b66c 0000 09a7 7fff ffff 0011 be0c 0200 0db5 0100 15ad
2306240 0100 33fd 0000 000b 0000 315f 003d 2f68 6f6d 652f 6f73 6173 312f 612f 7669 6a61 792f 5648 444c 2f70 6172 7365 722f 7072
2306320 6f6c 6f67 2f6e 6577 6e65 772f 7633 2e31 2f61 6464 636c 6175 7365 7300 0040 2f68 6f6d 652f 6f73 6173 312f 612f 7669 6a61
2306400 792f 5648 444c 2f70 6172 7365 722f 7072 6f6c 6f67 2f6e 6577 6e65 772f 7633 2e31 2f61 6464 636c 6175 7365 732e 706c 006f
2306460 0040 2f68 6f6d 652f 6f73 6173 312f 612f 7669 6a61 792f 5648 444c 2f70 6172 7365 722f 7072 6f6c 6f67 2f6e 6577 6e65 772f
2306540 7633 2e31 2f67 656e 6572 6963 5f75 7469 6c73 0065 0043 2f68 6f6d 652f 6f73 6173 312f 612f 7669 6a61 792f 5648 444c 2f70
2306620 6172 7365 722f 7072 6f6c 6f67 2f6e 6577 6e65 772f 7633 2e31 2f67 656e 6572 6963 5f75 7469 6c73 2e70 6c00 6f6c 0038 2f68
2306700 6f6d 652f 6f73 6173 312f 612f 7669 6a61 792f 5648 444c 2f70 6172 7365 722f 7072 6f6c 6f67 2f6e 6577 6e65 772f 7633 2e31
2306760 2f75 7469 6c73 0069 003b 2f68 6f6d 652f 6f73 6173 312f 612f 7669 6a61 792f 5648 444c 2f70 6172 7365 722f 7072 6f6c 6f67
2307040 2f6e 6577 6e65 772f 7633 2e31 2f75 7469 6c73 2e70 6c00 616e 0000 002c 0011 9520 b27c b66c 0000 09aa 7fff ffff 0010 f398
2307120 0200 0db5 0200 2f35 0000 5f2f 0000 032b 0000 315f 0000 002c 0018 1a88 b27c b66c 0000 116e 7fff ffff 0017 f5c4 0200 0db5
2307200 0200 224d 0000 7f97 0000 7f77 0000 315f 27f0 0014 0018 ae70 4e1c 0000 0000 0007 54f8 228c 0000 002c 0016 4fd4 b27c b66c
2307260 0000 116f 7fff ffff 0018 79f4 0200 0db5 0200 24bd 0000 3287 0000 7f77 0000 315f 0000 002c 0016 5000 b27c b66c 0000 1137
2307340 7fff ffff 0018 c1c4 0200 0db5 0200 284d 0000 7f77 0000 7f97 0000 315f 0000 0034 0016 5164 b27c b66c 0000 1138 7fff ffff
2307420 0011 77c8 0200 0db5 0400 242d 0000 7f77 0000 000b 0000 7f77 0000 21cf 0000 315f 0000 0034 0011 7794 b27c b66c 0000 1139
2307500 7fff ffff 0018 1e28 0200 0db5 0400 242d 0000 7f77 0000 0013 0000 7f77 0000 21cf 0000 315f 0011 7a5c 0000 01b4 b27c b66c
2307560 0000 09ad 0000 09be 0011 7860 0200 0db5 0500 1cdd 0000 5f57 0000 000b 0000 3287 008d f163 0000 032b 0000 315f 0011 785c
2307640 0000 002c b4f0 b4e4 0000 09ac 7fff ffff 0008 b0dd 0000 0000 0000 0000 0011 7bf0 0002 438a 0011 bf20 0011 7894 0000 0038
2307720 b27c b66c 0000 09ae 0000 09bf 0011 7898 0200 0db5 0500 1cdd 0000 5dbf 0000 001b 0000 3287 008a dee3 0000 032b 0000 315f
2310000 0011 78cc 0000 0038 b27c b66c 0000 09af 0000 09c0 0011 78d0 0200 0db5 0500 1cdd 0000 5c37 0000 0013 0000 3287 008a 50e3
2310060 0000 032b 0000 315f 0011 7904 0000 0038 b27c b66c 0000 09b0 0000 09c1 0011 7908 0200 0db5 0500 1cdd 0000 5c57 0000 001b
2310140 0000 3287 008a 5ce3 0000 032b 0000 315f 0011 793c 0000 0038 b27c b66c 0000 09b1 0000 09c2 0011 7940 0200 0db5 0500 1cdd
2310220 0000 5d67 0000 001b 0000 3287 008a c363 0000 032b 0000 315f 0011 7974 0000 0038 b27c b66c 0000 09b2 0000 09c3 0011 7978
2310300 0200 0db5 0500 1cdd 0000 5c5f 0000 0013 0000 3287 008d f363 0000 032b 0000 315f 0011 7a5c 0000 0038 b27c b66c 0000 09b3
2310360 0000 09c4 0011 7a60 0200 0db5 0500 1cdd 0000 5e27 0000 001b 0000 3287 008b 1343 0000 032b 0000 315f 27f0 0050 0011 79f8
2310440 45c4 4cc4 0000 323f 4740 42ac 0000 537f 0008 ec1c 0014 42ac 0000 5f5f 0008 ec1c 0014 39f8 0008 ec1c 0010 42ac 0000 3d47
2310520 0008 ec1c 0010 33a4 0008 ec1c 000c 247c 0008 d13c 000c 2eb0 2954 0060 0002 438a 4510 46ec 4740 42ac 0000 537f 0008 ec1c
2310600 0018 42ac 0000 5f5f 0008 ec1c 0018 3a4c 0008 ec1c 0014 42ac 0000 3d47 0008 ec1c 0014 39f8 0008 ec1c 0010 42ac 0000 5f5f
2310660 0008 ec1c 0010 33a4 0008 ec1c 000c 247c 0008 d13c 000c 2eb0 0011 9588 0000 1ac0 b27c b66c 0000 09b4 0000 09c5 0011 7a98
2310740 0200 0db5 0500 1cdd 0000 5ce7 0000 0003 0000 3287 008a 9483 0000 032b 0000 315f 0011 7acc 0000 0038 b27c b66c 0000 09b5
```

2311020 0000 09c6 0011 7ad0 0200 0db5 0500 1cdd 0000 5ce7 0000 000b 0000 3287 008a 96c3 0000 032b 0000 315f 0011 7b04 0000 0038
2311100 b27c b66c 0000 09b6 0000 09c7 0011 7b08 0200 0db5 0500 1cdd 0000 5ce7 0000 0013 0000 3287 008a 97c3 0000 032b 0000 315f
2311160 0011 7b3c 0000 0038 b27c b66c 0000 09b7 0000 09c8 0011 7b80 0200 0db5 0500 1cdd 0000 5e17 0000 0013 0000 3287 008b 0f63
2311240 0000 032b 0000 315f 0011 7b7c 0000 004c 0011 6584 0000 c000 0011 65d0 0000 0000 0000 0000 0000 0000 0011 6538 0000 0000
2311320 0000 0000 0011 667c 000e 1b8d 0011 64d4 0011 6548 0000 0000 0011 7bb4 0000 0038 b27c b66c 0000 09b8 0000 09c9 0011 7bb8
2311400 0200 0db5 0500 1cdd 0000 5d77 0000 000b 0000 3287 008a ca43 0000 032b 0000 315f 0011 7bec 0000 0038 b27c b66c 0000 09b9
2311460 0000 09ca 0011 7bf0 0200 0db5 0500 1cdd 0000 5b47 0000 0013 0000 3287 008a 0ae3 0000 032b 0000 315f 0011 7c24 0000 0038
2311540 b130 b66c 0000 09ba 0000 09cb 0011 7835 0200 0db5 0500 1cdd 0000 5d6f 0000 0013 0000 3287 008a c943 0000 032b 0000 315f
2311620 0011 9588 0000 18f8 0a69 6e69 745f 636f 756e 7428 696e 7465 726d 6564 6961 7465 2920 3a2d 0969 6e69 745f 636f 756e 7428
2311700 3136 292e 0925 2069 6e74 6572 6165 6469 6174 6520 6f75 7470 7574 206f 6620 4f70 6572 0a69 6e69 745f 636f 756e 7428 4e29
2311760 203a 2d20 0909 6374 725f 7365 7428 4e2c 3029 2e20 2020 2520 7365 7420 636f 756e 7465 7220 6e75 6d62 6572 204e 2074 6f20
2312040 7a65 726f 0a0a 2525 2525 2020 2073 6574 5f63 6f75 6e74 2845 6c65 6d65 6e74 2c20 4d29 0a25 2525 2520 2020 7365 7473 2074
2312120 6865 2063 6f75 6e74 6572 2066 6f72 2045 6c65 6465 6e74 2074 6f20 7468 6520 6e75 6d62 6572 204d 2e0a 0a73 6574 5f63 6f75
2312200 6e74 2865 6e74 6974 792c 4d29 2020 3a2d 2009 7365 745f 636f 756e 7428 382c 4d29 2e0a 7365 745f 636f 756e 7428 6172 6368
2312260 6974 6563 7475 7265 2c4d 2920 3a2d 2009 7365 745f 636f 756e 7428 382c 4d29 2e0a 7365 745f 636f 756e 7428 636f 6e73 7461
2312340 6e74 2c4d 2920 3a2d 2009 7365 745f 636f 756e 7428 312c 4d29 2e0a 7365 745f 636f 756e 7428 7661 7269 6162 6c65 2c4d 2920
2312420 3a2d 2009 7365 745f 636f 756e 7428 342c 4d29 2e0a 7365 745f 636f 756e 7428 6f70 6572 6174 6f72 2c4d 2920 3a2d 2009 7365
2312500 745f 636f 756e 7428 352c 4d29 2e0a 7365 745f 636f 756e 7428 696f 2c4d 2920 3a2d 2009 0973 6574 5f63 6f75 6e74 2836 2c4d
2312560 292e 0a73 6574 5f63 6f75 6e74 286f 7574 7075 742c 4d29 203a 2120 0909 7365 745f 636f 756e 7428 372c 4d29 2e0a 7365 745f
2312640 636f 756e 7428 7072 6f63 626f 6479 2c4d 2920 3a2d 2009 7365 745f 636f 756e 7428 382c 4d29 2e0a 7365 745f 636f 756e 7428
2312720 6272 616e 6368 2c4d 2920 3a2d 2009 0973 6574 5f63 6f75 6e74 2839 2c4d 292e 0a73 6574 5f63 6f75 6e74 2870 726f 6365 7373
2313000 2c4d 2920 3a2d 2009 7365 745f 636f 756e 7428 382c 4d29 2e0a 7365 745f 636f 756e 7428 7072 6f63 6564 7572 652c 4d29 203a
2313060 2d20 0973 6574 5f63 6f75 6e74 2838 2c4d 292e 0a73 6574 5f63 6f75 6e74 2866 756e 6374 696f 6e2c 4d29 203a 2d20 0973 6574
2313140 5f63 6f75 6e74 2838 2c4d 292e 0a73 6574 5f63 6f75 6e74 2873 7461 7465 626c 6f63 6b2c 4d29 203a 2d20 0973 6574 5f63 6f75
2313220 6e74 2838 2c4d 292e 0a73 6574 5f63 6f75 6e74 296c 696e 652c 4d29 203a 2d20 0909 7365 745f 636f 756e 7428 3134 2c4d 292e
2313300 0a73 6574 5f63 6f75 6e74 2864 6573 6967 6e2c 4d29 203a 2d20 0309 7365 745f 636f 756e 7428 3135 2c4d 292e 0a73 6574 5f63
2313360 6f75 6e74 2869 6e74 6572 6d65 6469 6174 652c 4d29 203a 2d09 7365 745f 636f 756e 7428 3136 2c4d 292e 0a73 6574 5f63 6f75
2313440 6e74 284e 2c4d 2920 3a2d 2009 0963 7472 5f73 6574 284e 2c4d 292e 2020 2025 2073 6574 2063 6f75 6e74 6572 206e 756d 6265
2313520 7220 4e20 746f 204d 0a0a 2525 2525 2020 2069 6e63 725f 636f 756e 7428 456c 656d 656e 7429 0a25 2525 2520 2020 496e 6372
2313600 656d 656e 7473 2063 6f75 6e74 6572 2066 6f72 2045 6c65 6d65 6e74 2062 7920 312e 0a0a 696e 6372 5f63 6f75 6e74 2865 6e74
2313660 6974 7929 203a 2d20 0909 696e 6372 5f63 6f75 6e74 2838 292e 0a69 6e63 725f 636f 756e 7428 6172 6368 6974 6563 7475 7265
2313740 2920 3a2d 2009 696e 6372 5f63 6f75 6e74 2838 292e 0a69 6e63 725f 636f 756e 7428 636f 6e73 7461 6e74 2920 3a2d 2009 696e
2314020 6372 5f63 6f75 6e74 2833 292e 0a69 6e63 725f 636f 756e 7428 7661 7269 6162 6c65 2920 3a2d 2009 696e 6372 5f63 6f75 6e74
2314100 2834 292e 0a69 6e63 725f 636f 756e 7428 6f70 6572 6174 6f72 2920 3a2d 2009 696e 6372 5f63 6f75 6e74 2835 292e 0a69 6e63
2314160 725f 636f 756e 7428 696f 2920 3a2d 2009 0969 6e63 725f 636f 756e 7428 3629 2e0a 696e 6372 5f63 6f75 6e74 286f 7574 7075
2314240 7429 203a 2d20 0909 696e 6372 5f63 6f75 6e74 2837 292e 0a69 6e63 725f 636f 756e 7428 7072 6f63 626f 6479 2920 3a2d 2009
2314320 696e 6372 5f63 6f75 6e74 2838 292e 0a69 6e63 725f 636f 756e 7428 6272 616e 6368 2920 3a2d 2009 0969 6e63 725f 636f 756e
2314400 7428 3929 2e0a 696e 6372 5f63 6f75 6e74 2870 726f 6365 7373 2920 3a2d 2009 0969 6e63 725f 636f 756e 7428 3829 2e0a 696e
2314460 6372 5f63 6f75 6e74 2870 726f 6365 6475 7265 2920 3a2d 2009 696e 6372 5f63 6f75 6e74 2838 292e 0a69 6e63 725f 636f 756e
2314540 7428 6675 6e63 7469 6f6e 2920 3a2d 2009 696e 6372 5f63 6f75 6e74 2838 292e 0a69 6e63 725f 636f 756e 7428 7374 6174 6562
2314620 6c6f 636b 2920 3a2d 2009 696e 6372 5f63 6f75 6e74 2838 292e 0a69 6e63 725f 636f 756e 7428 6c69 6e65 2920 3a2d 2009 0969
2314700 6e63 725f 636f 756e 7428 3134 292e 0a69 6e63 725f 636f 756e 7428 6465 7369 676e 2920 3a2d 2009 0969 6e63 725f 636f 756e
2314760 7428 3135 292e 0a69 6e63 725f 636f 756e 7428 696e 7465 726d 6564 6961 7465 2920 3a2d 0969 6e63 725f 636f 756e 7428 3136
2315040 292e 0a69 6e63 725f 636f 756e 7428 4e29 203a 2d20 0909 6374 725f 696e 6328 4e2c 3129 2e20 2020 2520 696e 6372 656d 656e
2315120 7420 636f 756e 7465 7220 4e20 6279 2031 0a0a 2525 2525 2020 2063 6f75 6e74 2845 6c65 6d65 6e74 2c20 4d29 0a25 2525 2520
2315200 2020 4d20 6973 2074 6865 2020 6375 7272 656e 7420 7661 6c75 6520 6f66 2074 6865 2063 6f75 6e74 6572 2066 6f72 2045 6c65
2315260 6d65 6e74 0a0a 636f 756e 7428 656e 7469 7479 2c4d 2920 3a2d 2009 0963 6f75 6e74 2838 2c4d 292e 0a63 6f75 6e74 2861 7263
2315340 6869 7465 6374 7572 652c 4d29 203a 2d20 0963 6f75 6e74 2838 2c4d 292e 0a63 6f75 6e74 2863 6f6e 7374 616e 742c 4d29 203a
2315420 2d20 0909 636f 756e 7428 332c 4d29 2e0a 636f 756e 7428 7661 7269 6162 6c65 2c4d 2920 3a2d 2009 0963 6f75 6e74 2834 2c4d
2315500 292e 0a63 6f75 6e74 286f 7065 7261 746f 722c 4d29 203a 2d20 0909 636f 756e 7428 352c 4d29 2e0a 636f 756e 7428 696f 2c4d
2315560 2920 3a2d 2020 0909 636f 756e 7428 362c 4d29 2e0a 636f 756e 7428 6f75 7470 7574 2c4d 2920 3a2d 2009 0963 6f75 6e74 2837
2315640 2c4d 292e 0a63 6f75 6e74 2870 726f 6362 6f64 792c 4d29 203a 2d20 2020 2020 2020 2020 2020 2063 6f75 6e74 2838 2c4d 292e
2315720 0a63 6f75 6e74 2862 7261 6e63 682c 4d29 203a 2d09 2020 2020 2020 2020 636f 756e 7428 392c 4d29 2e0a 636f 756e 7428 7072
2316000 6f63 6573 732c 4d29 203a 2d09 2020 2020 2020 2020 636f 756e 7428 382c 4d29 2e0a 636f 756e 7428 7072 6f63 6564 7572 652c
2316060 4d29 203a 2d09 2020 2020 2020 2020 636f 756e 7428 382c 4d29 2e0a 636f 756e 7428 6675 6e63 7469 6f6e 2c4d 2920 3a2d 0920

```
2316140  2020 2020 2020 2063 6f75 6e74 2838 2c4d 292e 0a63 6f75 6e74 2873 7461 7465 626c 6f63 6b2c 4d29 203a 2d09 2020 2020 2020
2316220  2020 636f 756e 7428 382c 4d29 2e0a 636f 756e 7428 6c69 6e65 2c4d 2920 3a2d 2020 0909 636f 756e 7428 3134 2c4d 292e 0a63
2316300  6f75 6e74 2864 6573 6967 6e2c 4d29 203a 2d20 2009 0963 6f75 6e74 2831 352c 4d29 2e0a 636f 756e 7428 696e 7465 726d 6564
2316360  6961 7465 2c4d 2920 3a2d 2009 636f 756e 7428 3136 2c4d 292e 0a63 6f75 6e74 284e 2c4d 2920 3a2d 2009 0909 6374 725f 6973
2316440  284e 2c4d 292e 2020 2020 2520 756e 6966 7920 4e20 7769 7468 2063 7572 7265 6e74 2076 616c 7565 0a20 2020 2020 2020 2020
2316520  2020 2020 2020 2020 2020 2020 2020 2020 2020 2020 2020 2020 2020 2020 2020 2020 2020 2020 2020 2025 206f 6620 636f 756e
2316600  7465 7220 4d0a 2525 2525 2525 2525 2525 2525 2525 2525 2525 2525 2525 2525 2525 2525 2525 2525 2525 2525 2525 2525 2525
2316660  2525 2525 2525 2525 2525 2525 2525 2525 2525 2525 2525 2525 2525 2525 2525 2525 2525 0a00 0000 0000 0000 0000 0000 0000
2316740  0000 0000 0000 0000 0000 0000 0000 0000 0000 0000 0000 0000 0000 0000 0000 0000 0000 0000 0000 0000 0000 0000 0000 0000
*
2326200  0000 0000 0000 0000 0000 002c 0011 bf28 b27c b66c 0000 09cf 7fff ffff 0011 76d0 0200 0db5 0200 2f35 0000 5f3f 0000 0333
2326260  0000 315f 0000 002c 0011 bf54 b27c b66c 0000 09d5 7fff ffff 000d 84b0 0200 0db5 0200 224d 0000 5f3f 0000 3287 0000 315f
2326340  0010 6765 6e65 7269 635f 7574 696c 732e 706c 0000 0011 9788 0000 0190 b27c b66c 0000 09d1 0000 09d4 000a d16d 0200 0db5
2326420  0200 270d 0000 5f3f 0000 3287 0000 315f 0011 95ec 0000 0038 b130 b66c 0000 09d2 0000 09d6 0011 95f1 0200 0db5 0500 1cdd
2326500  0000 5f6f 0000 0013 0000 3287 008d f263 0000 0333 0000 315f 0011 9788 0000 002c b4f0 b4e4 0000 09d1 7fff ffff 0008 b0dd
2326560  0000 0000 0000 0000 0011 95b8 0002 438a 0011 bf1c 0011 9788 0000 0100 0017 a7a9 0016 6ca5 0000 0000 000c c95d 0012 c2e4
2326640  0016 427d 0000 0000 0011 416c 000b 4390 0014 541d 000d c980 0000 0000 0017 f3bc 000c f008 0000 0000 0000 0000 000f c45c
2326720  0000 0000 0000 0000 0000 0000 0011 695c 000f c46c 0000 0000 0014 4c5d 0011 4b5c 000a 3859 0011 3830 0017 f2fd 0010 d844
2327000  0017 f08c 0018 39bd 0000 0000 000b b368 0000 0000 0017 f31d 0011 6884 0011 25f8 0011 6594 0015 b8e4 0011 6584 0012 7ce5
2327060  0000 0000 000c eb2c 0018 3b14 0000 0000 0000 0000 0016 4ba5 0000 0000 0018 aac9 0014 8550 000d d290 0016 47ec 000d ceb0
2327140  0000 0000 0000 0000 0000 0000 0000 0000 000e 838c 0000 0000 000b 3f94 0016 2335 000f d0c8 2c78 0040 0002 438a 2520 46ec
2327220  35ec 33a0 44e8 0000 0300 6217 6b48 671c 6b88 43e4 0200 0daf 4b8c 0000 0000 3287 6c34 247c 0008 c03c 0014 37f0 3cf4 234c
2327300  000d 8048 002a 7e6e 2a2a 2a20 5761 726e 696e 673a 2022 7e73 2220 6e6f 7420 7965 7420 696d 706c 656d 656e 7465 642e 7e6e
2327360  0072 6174 0011 9918 0000 0118 b27c b66c 0000 030b 0000 0a48 0011 97c4 0200 0db5 0500 1cdd 0000 56c7 0000 000b 0000 3287
2327440  0088 cde3 0000 033b 0000 315f 0011 97f8 0000 0038 b27c b66c 0000 0a0c 0000 0a49 0011 97fc 0200 0db5 0500 1cdd 0000 5a77
2327520  0000 000b 0000 3287 0089 d5e3 0000 033b 0000 315f 0011 9830 0000 0038 b27c b66c 0000 0a0d 0000 0a4a 0011 9834 0200 0db5
2327600  0500 1cdd 0000 602f 0000 000b 0000 3287 0090 1da3 0000 033b 0000 315f 0011 9868 0000 0038 b27c b66c 0000 0a0e 0000 0a4b
2327660  0011 986c 0200 0db5 0500 1cdd 0000 624f 0000 000b 0000 3287 0090 8dc3 0000 033b 0000 315f 0011 9918 0000 0038 b27c b66c
2327740  0000 0a0f 0000 0a4c 0011 991c 0200 0db5 0500 1cdd 0000 6257 0000 0013 0000 3287 0090 8ec3 0000 033b 0000 315f 27f0 0030
2330020  0011 98cc 45d0 45ec 3310 42ac 0000 52b7 0012 11f8 0018 3804 3b4c 0000 0012 1218 0014 37f0 3cf4 234c 0012 0fe4 2954 0048
2330100  0002 438a 45d0 46ec 3280 247c 0012 0fa4 0018 41e8 0000 52b7 3b4c 0000 0012 10d0 0018 3804 3b4c 0000 0012 1218 0014 37f0
2330160  3b4c 0000 0012 0fe4 0010 3cf4 242c 0000 0012 08d8 0011 99c8 0000 0038 b27c b66c 0000 0a10 0000 0a4d 0011 99cc 0200 0db5
2330240  0500 1cdd 0000 626f 0000 0013 0000 3287 0090 9283 0000 033b 0000 315f 27f0 0030 0011 997c 45d0 46ec 3310 42ac 0000 5237
2330320  0012 11f8 0018 3304 3b4c 0000 0012 1218 0014 37f0 3cf4 234c 0012 0fe4 2954 0048 0002 438a 45d0 46ec 3280 247c 0012 0fa4
2330400  0018 41e8 0000 5237 3b4c 0000 0012 10d0 0018 3304 3b4c 0000 0012 1218 0014 37f0 3b4c 0000 0012 0fe4 0010 3cf4 242c 0000
2330460  0012 08d8 0011 9bc0 0000 0150 b27c b66c 0000 0a11 0000 0a4e 0011 9a04 0200 0db5 0500 1cdd 0000 6277 0000 000b 0000 3287
2330540  0090 9423 0000 033b 0000 315f 0011 9a38 0000 0038 b27c b66c 0000 0a12 0000 0a4f 0011 9a3c 0200 0db5 0500 1cdd 0000 627f
2330620  0000 000b 0000 3287 0090 9723 0000 033b 0000 315f 0011 9a70 0000 0038 b27c b66c 0000 0a13 0000 0a50 0011 9a74 0200 0db5
2330700  0500 1cdd 0000 600f 0000 000b 0000 3287 0090 14e3 0000 033b 0000 315f 0011 9aa8 0000 0038 b27c b66c 0000 0a14 0000 0a51
2330760  0011 9aac 0200 0db5 0500 1cdd 0000 612f 0000 000b 0000 3287 0090 4ac3 0000 033b 0000 315f 0011 9ae0 0000 0038 b27c b66c
2331040  0000 0a15 0000 0a52 0011 9ae4 0200 0db5 0500 1cdd 0000 628f 0000 000b 0000 3287 0090 9c43 0000 033b 0000 315f 0011 9bc0
2331120  0000 0038 b130 b66c 0000 0a16 0000 0a53 0011 bff9 0200 0db5 0500 1cdd 0000 6297 0000 0013 0000 3287 0090 9f03 0000 033b
2331200  0000 315f 2938 0074 0011 9b88 5d10 0000 0200 523f 6784 687c 0020 4728 001c 3310 447c 0000 0200 523f 6bf4 6e58 0020 247c
2331260  0012 03fc 0024 3364 3af4 0020 0012 09f8 0020 33d8 382c 001c 4108 0000 000c 4118 0018 4580 6a00 5370 4568 640c 6d94 320c
2331340  4300 0000 0000 629f 0012 041c 0014 37f0 3cf4 234c 0012 13e0 2954 0034 0002 438a 2520 46d8 332c 247c 0012 03fc 0014 4580
2331420  6d50 5370 4568 640c 5370 320c 4240 0000 0000 604f 242c 0000 0012 041c 0011 bf90 0000 1964 0011 50f8 0000 0000 0000 0000
2331500  000e 1b8d 0000 0000 0000 0000 0000 0000 0011 4e04 0011 4cd8 0000 0000 0000 0000 0011 4c38 000a 3379 000a 3021 0000 0000
2331560  0011 4a70 0011 4970 0000 0000 0000 0000 0000 0000 0000 0000 0000 0000 0011 4fb0 0011 5150 0000 0000 0000 0000 0000 0000
2331640  0000 0000 0000 0000 0000 0000 0011 bf90 0000 18e4 0000 0000 0000 0000 0000 0000 0000 0000 0000 0000 0000 0000 0000 0000
2331720  0000 0000 0000 0000 0000 0000 0000 0000 0000 0000 0000 0000 0000 0000 0000 0000 0000 0000 0000 0000 0000 0000 0000 0000
*
2346220  2938 0020 0011 b568 4e1c 0000 0000 52b7 4240 0000 0000 0043 239c 0000 0010 d38c 27f0 0000 0011 b748 2ca0 0000 0000 003c
2346300  0000 0010 0011 b520 0011 b748 0002 438a 0010 f48c 0011 beac 28c4 0020 0011 b588 4e1c 0000 0000 5237 4240 0000 0000 0043
2346360  239c 0000 0010 d38c 28c4 0020 0011 b5a8 4e1c 0000 0000 1ff7 4240 0000 0000 001b 239c 0000 0010 d38c 28c4 0020 0011 b5c8
2346440  4e1c 0000 0000 32e7 4240 0000 0000 0023 239c 0000 0010 d38c 28c4 0020 0011 b608 4e1c 0000 0000 5ebf 4240 0000 0000 002b
```

```
2346520  239c 0000 0010 d38c 28c4 0020 0011 b688 4e1c 0000 0000 5347 4240 0000 0000 0043 239c 0000 0010 d38c 28c4 0020 0011 b628
2346600  4e1c 0000 0000 5ec7 4240 0000 0000 0033 239c 0000 0010 d38c 28c4 0020 0011 b648 4e1c 0000 0000 5ecf 4240 0000 0000 003b
2346660  239c 0000 0010 d38c 28c4 0020 0011 b668 4e1c 0000 0000 5ed7 4240 0000 0000 0043 239c 0000 0010 d38c 28c4 0020 0011 b5e8
2346740  4e1c 0000 0000 5edf 4240 0000 0000 004b 239c 0000 0010 d38c 28c4 0020 0011 b6a8 4e1c 0000 0000 533f 4240 0000 0000 0043
2347020  239c 0000 0010 d38c 28c4 0020 0011 b6c8 4e1c 0000 0000 52c7 4240 0000 0000 0043 239c 0000 0010 d38c 28c4 0020 0011 b6e8
2347100  4e1c 0000 0000 5ee7 4240 0000 0000 0043 239c 0000 0010 d38c 28c4 0020 0011 b708 4e1c 0000 0000 53ff 4240 0000 0000 0073
2347160  239c 0000 0010 d38c 28c4 0020 0011 b728 4e1c 0000 0000 5eef 4240 0000 0000 007b 239c 0000 0010 d38c 28c4 0020 0011 b748
2347240  4e1c 0000 0000 5ef7 4240 0000 0000 0083 239c 0000 0010 d38c 2954 0018 0002 438a 4254 0000 0000 0003 239c 0000 000e 72e0
2347320  000f 83d0 0200 5eff 0000 3287 0000 0008 0011 b7a0 0011 67fc 0001 0064 0000 0000 2938 0020 0011 b7c4 4e1c 0000 0000 52b7
2347400  4240 0000 0000 0043 239c 0000 0011 b770 27f0 0000 0011 67fc 2ca0 0000 0000 003c 0000 0010 0011 b780 0011 67fc 0002 438a
2347460  0010 f504 28c4 0020 0011 b7e4 4e1c 0000 0000 5237 4240 0000 0000 0043 239c 0000 0011 b770 28c4 0020 0011 b804 4e1c 0000
2347540  0000 1ff7 4240 0000 0000 001b 239c 0000 0011 b770 28c4 0020 0011 b824 4e1c 0000 0000 32e7 4240 0000 0000 0023 239c 0000
2347620  0011 b770 28c4 0020 0011 b864 4e1c 0000 0000 5ebf 4240 0000 0000 002b 239c 0000 0011 b770 28c4 0020 0011 b8e4 4e1c 0000
2347700  0000 5347 4240 0000 0000 0043 239c 0000 0011 b770 28c4 0020 0011 b884 4e1c 0000 0000 5ec7 4240 0000 0000 0033 239c 0000
2347760  0011 b770 28c4 0020 0011 b8a4 4e1c 0000 0000 5ecf 4240 0000 0000 003b 239c 0000 0011 b770 28c4 0020 0011 b8c4 4e1c 0000
2350040  0000 5ed7 4240 0000 0000 0043 239c 0000 0011 b770 28c4 0020 0011 b844 4e1c 0000 0000 5edf 4240 0000 0000 004b 239c 0000
2350120  0011 b770 28c4 0020 0011 b904 4e1c 0000 0000 533f 4240 0000 0000 0043 239c 0000 0011 b770 28c4 0020 0011 b924 4e1c 0000
2350200  0000 52c7 4240 0000 0000 0043 239c 0000 0011 b770 28c4 0020 0011 b944 4e1c 0000 0000 5ee7 4240 0000 0000 0043 239c 0000
2350260  0011 b770 28c4 0020 0011 b964 4e1c 0000 0000 53ff 4240 0000 0000 0073 239c 0000 0011 b770 28c4 0020 0011 b984 4e1c 0000
2350340  0000 5eef 4240 0000 0000 007b 239c 0000 0011 b770 28c4 0020 0011 67fc 4e1c 0000 0000 5ef7 4240 0000 0000 0083 239c 0000
2350420  0011 b770 2938 0020 0011 b9e8 4e1c 0000 0000 52b7 4240 0000 0000 0043 239c 0000 0010 da8c 27f0 0000 0011 bbc8 2ca0 0000
2350500  0000 003c 0000 0010 0011 b9a4 0011 bbc8 0002 438a 0010 f57c 28c4 0020 0011 ba08 4e1c 0000 0000 5237 4240 0000 0000 0043
2350560  239c 0000 0010 da8c 28c4 0020 0011 ba28 4e1c 0000 0000 1ff7 4240 0000 0000 001b 239c 0000 0010 da8c 28c4 0020 0011 ba48
2350640  4e1c 0000 0000 32e7 4240 0000 0000 0023 239c 0000 0010 da8c 28c4 0020 0011 ba88 4e1c 0000 0000 5ebf 4240 0000 0000 002b
2350720  239c 0000 0010 da8c 28c4 0020 0011 bb08 4e1c 0000 0000 5347 4240 0000 0000 0043 239c 0000 0010 da8c 28c4 0020 0011 baa8
2351000  4e1c 0000 0000 5ec7 4240 0000 0000 0033 239c 0000 0010 da8c 28c4 0020 0011 bac8 4e1c 0000 0000 5ecf 4240 0000 0000 003b
2351060  239c 0000 0010 da8c 28c4 0020 0011 bae8 4e1c 0000 0000 5ed7 4240 0000 0000 0043 239c 0000 0010 da8c 28c4 0020 0011 ba68
2351140  4e1c 0000 0000 5edf 4240 0000 0000 004b 239c 0000 0010 da8c 28c4 0020 0011 bb28 4e1c 0000 0000 533f 4240 0000 0000 0043
2351220  239c 0000 0010 da8c 28c4 0020 0011 bb48 4e1c 0000 0000 52c7 4240 0000 0000 0043 239c 0000 0010 da8c 28c4 0020 0011 bb68
2351300  4e1c 0000 0000 5ee7 4240 0000 0000 0043 239c 0000 0010 da8c 28c4 0020 0011 bb88 4e1c 0000 0000 53ff 4240 0000 0000 0073
2351360  239c 0000 0010 da8c 28c4 0020 0011 bba8 4e1c 0000 0000 5eef 4240 0000 0000 007b 239c 0000 0010 da8c 28c4 0020 0011 bbc8
2351440  4e1c 0000 0000 5ef7 4240 0000 0000 0083 239c 0000 0010 da8c 2954 0018 0002 438a 4254 0000 0000 000b 239c 0000 000e 7360
2351520  2938 0020 0011 bc24 4e1c 0000 0000 52b7 4240 0000 0000 0043 239c 0000 0010 dfb4 27f0 0000 0011 6784 2ca0 0000 0000 003c
2351600  0000 0010 0011 bbe0 0011 6784 0002 438a 0010 f5f4 28c4 0020 0011 bc44 4e1c 0000 0000 5237 4240 0000 0000 0043 239c 0000
2351660  0010 dfb4 28c4 0020 0011 bc64 4e1c 0000 0000 1ff7 4240 0000 0000 001b 239c 0000 0010 dfb4 28c4 0020 0011 bc84 4e1c 0000
2351740  0000 32e7 4240 0000 0000 0023 239c 0000 0010 dfb4 28c4 0020 0011 bcc4 4e1c 0000 0000 5ebf 4240 0000 0000 002b 239c 0000
2352020  0010 dfb4 28c4 0020 0011 bd44 4e1c 0000 0000 5347 4240 0000 0000 0043 239c 0000 0010 dfb4 28c4 0020 0011 bce4 4e1c 0000
2352100  0000 5ec7 4240 0000 0000 0033 239c 0000 0010 dfb4 28c4 0020 0011 bd04 4e1c 0000 0000 5ecf 4240 0000 0000 003b 239c 0000
2352160  0010 dfb4 28c4 0020 0011 bd24 4e1c 0000 0000 5ed7 4240 0000 0000 0043 239c 0000 0010 dfb4 28c4 0020 0011 bca4 4e1c 0000
2352240  0000 5edf 4240 0000 0000 004b 239c 0000 0010 dfb4 28c4 0020 0011 bd64 4e1c 0000 0000 533f 4240 0000 0000 0043 239c 0000
2352320  0010 dfb4 28c4 0020 0011 bd84 4e1c 0000 0000 52c7 4240 0000 0000 0043 239c 0000 0010 dfb4 28c4 0020 0011 bda4 4e1c 0000
2352400  0000 5ee7 4240 0000 0000 0043 239c 0000 0010 dfb4 28c4 0020 0011 bdc4 4e1c 0000 0000 53ff 4240 0000 0000 0073 239c 0000
2352460  0010 dfb4 28c4 0020 0011 bde4 4e1c 0000 0000 5eef 4240 0000 0000 007b 239c 0000 0010 dfb4 28c4 0020 0011 6784 4e1c 0000
2352540  0000 5ef7 4240 0000 0000 0083 239c 0000 0010 dfb4 0015 6173 7365 7274 5f63 7572 7265 6e74 5f65 6e74 6974 7900 000f 915c
2352620  0100 5f57 0000 3287 0000 0004 0011 749c 0011 748c 0001 0065 0000 0000 000f 97c4 0200 5f6f 0000 3287 0000 0008 0011 df28
2352700  0011 df28 0001 0066 0000 0000 0011 4be4 0200 5c5f 0000 3287 0000 0008 0011 745c 0011 745c 0001 0065 0000 0000 2cac 0000
2352760  0002 438a 2ca0 0000 0000 0004 0000 0002 000d 8514 0010 f3e8 0002 438a 000b 45f0 2c78 001c 0002 438a 5d10 0000 0100 2627
2353040  5fa0 5b58 0100 53c7 5fa0 228c 2cac 0000 0002 438a 2ca0 0000 0000 0000 0000 0001 0011 bea0 0011 bea0 0002 438a 0011 b564
2353120  2cac 0000 0002 438a 2ca0 0000 0000 0000 0000 0001 0010 b3ac 0010 b3ac 0002 438a 0011 bf04 0010 b3b8 000e 6e65 775f 7374
2353200  6174 6562 6c6f 636b 0011 69bc 0011 c674 0000 002c 0011 e188 b27c b66c 0000 09da 7fff ffff 0011 9520 0200 0db5 0200 2f35
2353260  0000 5f4f 0000 033b 0000 315f 0000 002c 0011 e1b4 b27c b66c 0000 0a19 7fff ffff 0011 954c 0200 0db5 0200 224d 0000 5f4f
2353340  0000 3287 0000 315f 000f 7072 6f63 626f 6479 5f69 6e70 7574 7300 0000 0011 c140 0000 00c8 b27c b66c 0000 09dc 0000 0a18
2353420  000a d16d 0200 01b5 0200 2703 0000 5f4f 0000 3287 0000 315f 0011 bff4 0000 0038 b27c b66c 0000 09dd 0000 0a1a 0011 c024
2353500  0200 0db5 0500 1cdd 0000 2027 0000 0013 0000 3287 008f fb03 0000 033b 0000 315f 0011 c020 0000 002c b4f0 b4e4 0000 09dc
2353560  7fff ffff 0008 b0dd 0000 0000 0000 0000 0011 9ae4 0002 438a 0012 1444 0011 c140 0000 0038 b27c b66c 0000 09de 0000 0a1b
```

2353640 0011 c144 0200 0db5 0500 1cdd 0000 5a1f 0000 000b 0000 3287 0089 bbc3 0000 033b 0000 315f 2c78 00e8 0002 438a 45c4 4550
2353720 6d50 5370 4568 4af8 0000 0373 5370 4538 4b8c 0000 0000 03f3 6bf4 4568 4b8c 0000 0000 0173 6b74 4538 4b8c 0000 0000 030b
2354000 6bf4 4568 4b8c 0000 0000 03f3 6b74 4538 4b8c 0000 0000 0103 6bf4 4568 4b8c 0000 0000 03cb 6b74 4538 4b8c 0000 0000 03a3
2354060 6bf4 4568 4b8c 0000 0000 034b 6b74 4538 4b8c 0000 0000 03a3 6bf4 4568 4b8c 0000 0000 0373 6b74 4538 4b8c 0000 0000 032b
2354140 6bf4 247c 0008 c0fc 0014 42ac 0000 1ff7 0010 d38c 0014 42ac 0000 32e7 0010 d38c 0014 42ac 0000 5ebf 0010 d38c 0014 37f0
2354220 3280 247c 0011 ff80 0010 3d24 4300 0000 0000 52b7 0011 ffa0 000c 2eb0 0011 c334 0000 0070 b27c b66c 0000 09df 0000 0a1c
2354300 0011 c17c 0200 0db5 0500 1cdd 0000 5a27 0000 0003 0000 3287 0089 bcc3 0000 033b 0000 315f 0011 c334 0000 0038 b27c b66c
2354360 0000 09e0 0000 0a1d 0011 c338 0200 0db5 0500 1cdd 0000 565f 0000 0013 0000 3287 0088 b7a3 0000 033b 0000 315f 2c78 0184
2354440 0002 438a 4540 46ec 4538 6d50 5370 4550 6d94 6b74 4568 4af9 0000 0373 5370 4538 4b8c 0000 0000 03f3 6bf4 4568 4b8c 0000
2354520 0000 0173 6b74 4538 4b8c 0000 0000 030b 6bf4 4568 4b8c 0000 0000 03f3 6b74 4538 4b8c 0000 0000 0103 6bf4 4568 4b8c 0000
2354600 0000 0333 6b74 4538 4b8c 0000 0000 037b 6bf4 4568 4b8c 0000 0000 0103 6b74 4538 4b8c 0000 0000 030b 6bf4 4568 4b8c 0000
2354660 0000 03f3 6b74 4538 4b8c 0000 0000 0103 6bf4 4568 4b8c 0000 0000 032b 6b74 4538 4b8c 0000 0000 0393 6bf4 4568 4b8c 0000
2354740 0000 03ab 6b74 4538 4b8c 0000 0000 03a3 6bf4 4568 4b8c 0000 0000 031b 6b74 4538 4b8c 0000 0000 032b 6bf4 4568 4b8c 0000
2355020 0000 03a3 6b74 4538 4b8c 0000 0000 034b 6bf4 4568 4b8c 0000 0000 0343 6b74 4538 4b8c 0000 0000 031b 6bf4 4568 4b8c 0000
2355100 0000 0393 6b74 4538 4b8c 0000 0000 030b 6bf4 247c 0008 c0fc 0018 42ac 0000 1ff7 0010 d38c 0018 42ac 0000 32e7 0010 d38c
2355160 0018 42ac 0000 5ebf 0010 d38c 0018 386c 37f0 3280 2410 0000 0012 0024 0010 3d24 4300 0000 0000 5237 0011 ffa0 000c 2eb0
2355240 0011 c41c 0000 0070 b27c b66c 0000 09e1 0000 0a1e 0011 c370 0200 0db5 0500 1cdd 0000 5687 0000 0003 0000 3287 0088 bca3
2355320 0000 033b 0000 315f 0011 c41c 0000 0038 b27c b66c 0000 09e2 0000 0a1f 0011 c420 0200 0db5 0500 1cdd 0000 5d9f 0000 0003
2355400 0000 3287 008a d6c3 0000 033b 0000 315f 2c78 0078 0002 438a 2520 42ac 0000 32e7 0010 d38c 0014 42ac 0000 5ebf 0010 d38c
2355460 0014 329c 24d0 0000 0012 00c0 0014 3d30 4300 0000 0000 5347 0011 ffa0 0010 3280 24d0 0000 0012 00e0 0010 3d24 4300 0000
2355540 0000 5ee7 0011 ffa0 000c 42ac 0000 5fbf 0008 ec1c 000c 42ac 0000 000f 0008 ec1c 000c 234c 0008 d13c 0011 c4ac 0000 0038
2355620 b27c b66c 0000 09e3 0000 0a20 0011 c4b0 0200 0db5 0500 1cdd 0000 5daf 0000 0003 0000 3287 008a d8c3 0000 033b 0000 315f
2355700 2c78 0056 0002 438a 2520 332c 4300 0000 0000 5ee7 0011 ffe4 0014 4078 0012 0114 0010 3310 4300 0000 0000 5347 0011 ffe4
2355760 0010 4064 0012 0134 000c 42ac 0000 5fd7 0008 ec1c 000c 42ac 0000 000f 0008 ec1c 000c 234c 0008 d13c 0011 c5bc 0000 0038
2356040 b27c b66c 0000 09e4 0000 0a21 0011 c5c0 0200 0db5 0500 1cdd 0000 5cb7 0000 000b 0000 3287 008a 83e3 0000 033b 0000 315f
2356120 2c78 00d8 0002 438a 5d10 0000 0100 53cf 6840 3380 0028 42ac 0000 5ee7 0011 ffe4 002c 3c9c 0000 0028 0012 0114 002c 3380
2356200 0024 411c 0000 0028 0012 017c 0028 32f0 0020 247c 0012 00e0 0028 3348 3af4 0020 0012 017c 0028 3804 40b4 0024 0012 019c
2356260 0024 3e70 0020 42ac 0000 5ee7 0011 ffa0 0020 3310 3ba0 0000 0012 01bc 0020 32f0 001c 247c 0012 00e0 0020 3364 3af4 001c
2356340 0012 017c 0020 3e70 001c 42ac 0000 5ee7 0011 ffa0 001c 38ac 44c4 0000 0100 5ff7 6d80 3d48 40f4 0000 0012 01dc 0014 43e4
2356420 0200 6007 6d80 6d0c 4240 0000 0000 5fff 242c 0000 0011 ffa0 0011 c734 0000 00b0 b27c b66c 0000 09e5 0000 0a22 0011 c638
2356500 0200 0db5 0500 1cdd 0000 5cbf 0000 0003 0000 3287 009a 84e3 0000 033b 0000 315f 0011 c62c 0000 0038 b27c b66c 0000 09f1
2356560 0000 0a2e 0011 d024 0200 0db5 0500 1cdd 0000 6147 0000 0013 0000 3287 0090 4fc3 0000 033b 0000 315f 0011 c634 0000 0008
2356640 0011 c734 0000 0038 b27c b66c 0000 09e6 0000 0a23 0011 c738 0200 0db5 0500 1cdd 0000 5cbf 0000 000b 0000 3287 0090 02e3
2356720 0000 033b 0000 315f 2c78 00cd 0002 438a 5d10 0000 0200 6007 697c 001c 6af0 0020 3310 42ac 0000 5ee7 0011 ffe4 002c 3380
2357000 0028 39a4 0012 017c 002c 332c 4300 0000 0000 5ee7 0011 ffe4 002c 3348 3ba0 0000 0012 017c 002c 3804 40b4 0028 0012 019c
2357060 0028 32f0 0024 247c 0012 00e0 0028 3364 3af4 0024 0012 017c 0028 3e70 0024 42ac 0000 5ee7 0011 ffa0 0024 442c 0100 2a37
2357140 6e58 0020 447c 0000 0200 5ac7 4b8c 0000 0000 2a37 6e58 001c 44c4 0000 0100 5ff7 6b74 3d48 40f4 0000 0012 01dc 0014 4078
2357220 0012 0114 0010 3cf4 242c 0000 0012 0114 0011 c7d0 0000 0070 b27c b66c 0000 09e7 0000 0a24 0011 c770 0200 0db5 0500 1cdd
2357300 0000 5e87 0000 0013 0000 3287 008b 47a3 0000 033b 0000 315f 0011 c7d0 0000 0038 b27c b66c 0000 09e8 0000 0a25 0011 c7d4
2357360 0200 0db5 0500 1cdd 0000 5e87 0000 c01b 0000 3287 0090 15e3 0000 033b 0000 315f 2954 002c 0002 438a 56f8 671c 682c 46ec
2357440 4768 38d4 3858 41e8 0000 2717 24d0 0000 0012 032c 0018 231c 0012 02bc 0011 c9ec 0000 0038 b27c b66c 0000 09e9 0000 0a26
2357520 0011 c9f0 0200 0db5 0500 1cdd 0000 5e7f 0000 0013 0000 3287 008b 4523 0000 033b 0000 315f 2c78 01e4 0002 438a 45b8 46ec
2357600 2ba0 0014 0010 39a4 0012 0374 0014 2330 0012 0394 2c58 4538 4b8c 0000 0000 0173 5370 4550 4b8c 0000 0000 0323 6b74 4538
2357660 4b8c 0000 0000 032b 6bb4 4550 4b8c 0000 0000 0363 6b74 4538 4b8c 0000 0000 034b 6bb4 4550 4b8c 0000 0000 030b 6b74 4538
2357740 4b8c 0000 0000 0333 6bb4 4550 4b8c 0000 0000 0103 6b74 4538 4b8c 0000 0000 03a3 6bb4 4550 4b8c 0000 0000 032b 6b74 4538
2360020 4b8c 0000 0000 033b 6bb4 4550 4b8c 0000 0000 0393 6b74 4538 4b8c 0000 0000 030b 6bb4 4550 4b8c 0000 0000 03a3 6b74 4538
2360100 4b8c 0000 0000 0103 6bb4 4550 4b8c 0000 0000 037b 6b74 4538 4b8c 0000 0000 03a3 6bb4 4550 4b8c 0000 0000 0103 6b74 4538
2360160 4b8c 0000 0000 03a3 6bb4 4550 4b8c 0000 0000 0373 6b74 4538 4b8c 0000 0000 032b 6bb4 4550 4b8c 0000 0000 036b 6b74 4538
2360240 4b8c 0000 0000 0373 6bb4 4550 4b8c 0000 0000 033b 6b74 4538 4b8c 0000 0000 034b 6bb4 4550 4b8c 0000 0000 039b 6b74 4538
2360320 4b8c 0000 0000 039b 6bb4 4550 4b8c 0000 0000 030b 6b74 4538 4b8c 0000 0000 0103 6bb4 4550 4b8c 0000 0000 032b 6b74 4538
2360400 4b8c 0000 0000 0363 6bb4 4550 4b8c 0000 0000 0313 6b74 4538 4b8c 0000 0000 030b 6bb4 4550 4b8c 0000 0000 034b 6b74 4538
2360460 4b8c 0000 0000 0393 6bb4 4550 4b8c 0000 0000 030b 6b74 4538 4b8c 0000 0000 02b3 6bb4 234c 0012 03b4 0011 cb4c 0000 0038
2360540 b27c b66c 0000 09ea 0000 0a27 0011 cb50 0200 0db5 0500 1cdd 0000 6027 0000 0013 0000 3287 0090 1ca3 0000 033b 0000 315f
2360620 27f0 0058 0011 ca78 45e8 001c 517c 0000 0300 5ac7 69b0 671c 6af0 0020 332c 247c 0012 01bc 0024 3348 3af4 0020 0012 01bc
2360700 0020 3364 3af4 001c 0012 03fc 001c 4580 6dd8 5370 4538 6d94 5370 4568 6d50 6b74 320c 2340 0012 041c 28c4 0040 0011 cab8

| | | | | | | | | | | | | | | | | | | | | | | | | |
|---|---|---|---|---|---|---|---|---|---|---|---|---|---|---|---|---|---|---|---|---|---|---|---|---|
| 2360760 | 45dc | 5b58 | 0200 | 5ac7 | 69b0 | 671c | 332c | 247c | 0012 | 01bc | 001c | 3348 | 3c48 | 0000 | 0012 | 03fc | 0018 | 4580 | 6d94 | 5370 | 4568 | 6d50 | 5370 | 320c |
| 2361040 | 2420 | 0000 | 0012 | 041c | 28c4 | 0050 | 0011 | cb08 | 45d0 | 5b58 | 0200 | 5b4f | 671c | 6aa0 | 3818 | 247c | 0011 | 415c | 001c | 3310 | 3c48 | 0000 | 0012 | 0458 |
| 2361120 | 0018 | 332c | 3bf4 | 0000 | 0012 | 03fc | 0014 | 4530 | 6d50 | 5370 | 3d54 | 320c | 4240 | 0000 | 0000 | 5b4f | 242c | 0000 | 0012 | 041c | 2954 | 0040 | 0002 | 438a |
| 2361200 | 45d0 | 3574 | 3310 | 247c | 0012 | 01bc | 0018 | 332c | 3bf4 | 0000 | 0012 | 03fc | 0014 | 4580 | 6d50 | 5370 | 4568 | 6d0c | 5370 | 320c | 4240 | 0000 | 0000 | 604f |
| 2361260 | 242c | 0000 | 0012 | 041c | 0011 | cc00 | 0000 | 0038 | b27c | b66c | 0000 | 09eb | 0000 | 0a28 | 0011 | cc04 | 0200 | 0db5 | 0500 | 1cdd | 0000 | 603f | 0000 | 0023 |
| 2361340 | 0000 | 3287 | 0090 | 20e3 | 0000 | 033b | 0000 | 315f | 2c78 | 007c | 0002 | 438a | 45e8 | 0024 | 46d8 | 4790 | 0020 | 47f8 | 001c | 39a4 | 0012 | 04c8 | 0028 | 382c |
| 2361420 | 0024 | 39a4 | 0012 | 04e8 | 0024 | 3364 | 3b4c | 0000 | 0012 | 0508 | 0024 | 3468 | 3894 | 0020 | 3818 | 42ac | 0000 | 6077 | 0012 | 0528 | 0020 | 344c | 3894 | 001c |
| 2361500 | 3348 | 42ac | 0000 | 5ecf | 0012 | 0528 | 0018 | 3d3c | 3b4c | 0000 | 0012 | 0548 | 0014 | 3d30 | 3b4c | 0000 | 0012 | 0568 | 0010 | 2340 | 0012 | 0588 | 0011 | cc68 |
| 2361560 | 0000 | 0038 | b27c | b66c | 0000 | 09ec | 0000 | 0a29 | 0011 | cc6c | 0200 | 0db5 | 0500 | 1cdd | 0000 | 606f | 0000 | 0023 | 0000 | 3287 | 0090 | 2943 | 0000 | 033b |
| 2361640 | 0000 | 315f | 2c78 | 0030 | 0002 | 438a | 45b8 | 46ec | 477c | 47f8 | 001c | 32b8 | 24d0 | 0000 | 0012 | 029c | 0020 | 3984 | 0018 | 001c | 38e8 | 3d6c | 2410 | 0000 |
| 2361720 | 0012 | 05a8 | 0011 | cd2c | 0000 | 0038 | b27c | b66c | 0000 | 09ed | 0000 | 0a2a | 0011 | cd30 | 0200 | 0db5 | 0500 | 1cdd | 0000 | 606f | 0000 | 002b | 0000 | 3287 |
| 2362000 | 0090 | 2d43 | 0000 | 033b | 0000 | 315f | 2954 | 008c | 0002 | 438a | 45b8 | 46ec | 4768 | 5818 | 6af0 | 0024 | 6aa0 | 5878 | 0018 | 6af0 | 0028 | 6af0 | 001c | 32f0 |
| 2362060 | 0020 | 247c | 0012 | 0608 | 002c | 37dc | 3af4 | 0020 | 0012 | 0628 | 002c | 37f0 | 3af4 | 0020 | 0012 | 0648 | 002c | 3804 | 3af4 | 0020 | 0012 | 0668 | 002c | 382c |
| 2362140 | 0028 | 3c9c | 0000 | 0020 | 0012 | 0688 | 0028 | 3894 | 0024 | 382c | 0020 | 39a4 | 0012 | 06a8 | 0024 | 411c | 0000 | 0020 | 0012 | 06c8 | 0020 | 2ecc | 3984 | 0018 |
| 2362220 | 001c | 2304 | 0012 | 05a8 | 0011 | cee8 | 0000 | 0038 | b27c | b66c | 0000 | 09ee | 0000 | 0a2b | 0011 | ceec | 0200 | 0db5 | 0500 | 1cdd | 0000 | 60b7 | 0000 | 001b |
| 2362300 | 0000 | 3287 | 0090 | 3543 | 0000 | 033b | 0000 | 315f | 27f0 | 0044 | 0011 | cda4 | 4e1c | 0000 | 0000 | 5ecf | 2520 | 46d8 | 4754 | 9314 | 936c | 3364 | 3b4c | 0000 |
| 2362360 | 0012 | 0648 | 001c | 3348 | 32b8 | 247c | 0012 | 0714 | 0018 | 3d3c | 3b4c | 0000 | 0012 | 0734 | 0014 | 2330 | 0012 | 0688 | 28c4 | 003c | 0011 | cde0 | 4e1c | 0000 |
| 2362440 | 0000 | 5ecf | 2520 | 46d8 | 4768 | 9328 | 9410 | 3804 | 3b4c | 0000 | 0012 | 0734 | 0018 | 3804 | 329c | 247c | 0012 | 03fc | 0014 | 3d30 | 2420 | 0000 | 0012 | 077c |
| 2362520 | 28c4 | 00a8 | 0011 | ce88 | 4e1c | 0000 | 0000 | 6077 | 2520 | 46d8 | 4768 | 3a4c | 0012 | 07d8 | 0024 | 3804 | 3b4c | 0000 | 0012 | 0734 | 0024 | 2e7c | ae74 | 0020 |
| 2362600 | 2ba0 | 0024 | 005c | 3a4c | 0012 | 07f8 | 0024 | aa98 | 0020 | 2e98 | 3804 | 32f0 | 001c | 247c | 0012 | 0818 | 0020 | 3364 | 3af4 | 001c | 0012 | 0838 | 0020 | 332c |
| 2362660 | 40b4 | 001c | 0012 | 0858 | 001c | 41e8 | 0000 | 1ff7 | 3b4c | 0000 | 0012 | 0878 | 001c | 3d48 | 3b4c | 0000 | 0012 | 0898 | 0018 | 3d30 | 2420 | 0000 | 0012 | 077c |
| 2362740 | 2c58 | 3804 | 329c | 247c | 0012 | 03fc | 0014 | 3d30 | 2420 | 0000 | 0012 | 077c | 2954 | 005a | 0002 | 438a | 4e1c | 0000 | 0000 | 6077 | 2520 | 46d8 | 477c | 3aa0 |
| 2363020 | 0012 | 03b8 | 001c | 3818 | 3b4c | 0000 | 0012 | 0734 | 001c | 3918 | 32b8 | 247c | 0012 | 0688 | 0018 | 3a4c | 0012 | 08d8 | 0018 | 2ecc | 332c | 408c | 0012 | 077c |
| 2363100 | 0014 | 9314 | 9460 | 000a | 3d30 | 2340 | 0012 | 077c | 22a0 | 0000 | 0011 | cf68 | 0000 | 0038 | b27c | b66c | 0000 | 09ef | 0000 | 0a2c | 0011 | cf6c | 0200 | 0db5 |
| 2363160 | 0500 | 1cdd | 0000 | 6057 | 0000 | 000b | 0000 | 3287 | 0090 | 2643 | 0000 | 033b | 0000 | 315f | 2c78 | 0048 | 0002 | 438a | 45b8 | 3348 | 4300 | 0000 | 0000 | 5ebf |
| 2363240 | 0011 | be4c | 0018 | 42ac | 0000 | 5ec7 | 0010 | d38c | 0018 | 3d3c | 3b4c | 0000 | 0012 | 0938 | 0014 | 329c | 24d0 | 0000 | 0012 | 0958 | 0014 | 3d30 | 2420 | 0000 |
| 2363320 | 0012 | 0978 | 0011 | d020 | 0000 | 0038 | b27c | b66c | 0000 | 09f0 | 0000 | 0a2d | 0011 | c5f8 | 0200 | 0db5 | 0500 | 1cdd | 0000 | 608f | 0000 | 000b | 0000 | 3287 |
| 2363400 | 0090 | 3043 | 0000 | 033b | 0000 | 315f | 28c4 | 002c | 0012 | 0ff4 | 2520 | 46ec | 35c8 | 3280 | 24d0 | 0000 | 0012 | 0fe4 | 0014 | 39a4 | 0012 | 08d8 | 0014 | 37f0 |
| 2363460 | 3cf4 | 234c | 0012 | 0fc4 | 28c4 | 002c | 0012 | 1030 | 2520 | 46ec | 35c8 | 3280 | 24d0 | 0000 | 0012 | 0508 | 0014 | 39a4 | 0012 | 08d8 | 0014 | 37f0 | 3cf4 | 234c |
| 2363540 | 0012 | 0978 | 2c78 | 0028 | 0002 | 438a | 44c4 | 0000 | 0200 | 0ad7 | 4b8c | 0000 | 0000 | 6317 | 6b88 | 43e4 | 0100 | 61bf | 6bf4 | 22bc | 0012 | 0fe4 | 0011 | d1fc |
| 2363620 | 0000 | 0038 | b27c | b66c | 0000 | 09f2 | 0000 | 0a2f | 0011 | d200 | 0200 | 0db5 | 0500 | 1cdd | 0000 | 5fef | 0000 | 0013 | 0000 | 3287 | 0090 | 0de3 | 0000 | 033b |
| 2363700 | 0000 | 315f | 2938 | 004c | 0011 | d0a0 | 5d10 | 0000 | 0300 | 5ac7 | 682c | 671c | 6af0 | 001c | 4714 | 332c | 24d0 | 0000 | 0012 | 01bc | 0020 | 3348 | 3af4 | 001c |
| 2363760 | 0012 | 01bc | 001c | 4580 | 6dd8 | 5370 | 4538 | 6d94 | 5370 | 4568 | 6d50 | 6b74 | 320c | 2340 | 0012 | 041c | 28c4 | 0038 | 0011 | d0d8 | 5d10 | 0000 | 0200 | 5ac7 |
| 2364040 | 682c | 671c | 4700 | 332c | 24d0 | 0000 | 0012 | 01bc | 0018 | 4580 | 6d94 | 5370 | 4568 | 6d50 | 5370 | 320c | 2420 | 0000 | 0012 | 041c | 28c4 | 0048 | 0011 | d120 |
| 2364120 | 5110 | 0000 | 0200 | 5b4f | 671c | 6854 | 46ec | 3804 | 24d0 | 0000 | 0011 | 415c | 0018 | 3310 | 3bf4 | 0000 | 0012 | 0458 | 0014 | 4580 | 6d50 | 5370 | 3d54 | 320c |
| 2364200 | 4240 | 0000 | 0000 | 5b4f | 242c | 0000 | 0012 | 041c | 28c4 | 0098 | 0011 | d1b8 | 5d10 | 0000 | 0200 | 523f | 6784 | 687c | 0024 | 4714 | 3348 | 43c0 | 0200 | 523f |
| 2364260 | 6bf4 | 6e58 | 0024 | 247c | 0011 | 48bc | 0028 | 332c | 3af4 | 0024 | 0012 | 09f8 | 0024 | 2e7c | ae74 | 0020 | 2ba0 | 0024 | 0034 | 3380 | 001c | 3a4c | 0012 | 0a98 |
| 2364340 | 0024 | aa88 | 0020 | 2e98 | 4580 | 6dd8 | 5370 | 4568 | 6e1c | 001c | 6d50 | 320c | 46d8 | 41d4 | 0000 | 6157 | 242c | 0000 | 0012 | 041c | 2c58 | 4580 | 6dd8 | 5370 |
| 2364420 | 4568 | 6d94 | 6d50 | 320c | 46d8 | 41d4 | 0000 | 6157 | 242c | 0000 | 0012 | 041c | 2954 | 0040 | 0002 | 438a | 2520 | 46d8 | 332c | 247c | 0012 | 03fc | 001c | 2e7c |
| 2364500 | ae30 | 2ba0 | 001c | 0018 | 3348 | 39f8 | 0012 | 0a98 | 001c | aa6c | 2e98 | 3d0c | 4a7c | 000c | 723c | 2c58 | 3d00 | 4a7c | 000c | 723c | 0011 | d2d4 | 0000 | 0038 |
| 2364560 | b27c | b66c | 0000 | 09f3 | 0000 | 0a30 | 0011 | d2d8 | 0200 | 0db5 | 0500 | 1cdd | 0000 | 614f | 0000 | 0013 | 0000 | 3287 | 0090 | 54c3 | 0000 | 033b | 0000 | 315f |
| 2364640 | 2c78 | 009e | 0002 | 438a | 45e8 | 0024 | 4714 | 3c9c | 0000 | 0024 | 0012 | 07d8 | 0028 | 382c | 0024 | 32f0 | 0020 | 247c | 0012 | 0acc | 0024 | 3c9c | 0000 | 0020 |
| 2364720 | 0012 | 04d8 | 0024 | 2ecc | 332c | 3c9c | 0000 | 0020 | 0012 | 0aec | 0024 | 3380 | 001c | 411c | 0000 | 0020 | 0012 | 0b0c | 0020 | 41e8 | 0000 | 5ecf | 32b8 | 247c |
| 2365000 | 0012 | 0628 | 0020 | 3e70 | 001c | 3a4c | 0012 | 0668 | 001c | 3818 | 3bf4 | 0000 | 0012 | 0688 | 0018 | 3310 | 3bf4 | 0000 | 0012 | 077c | 0018 | 408c | 0012 | 08d8 |
| 2365060 | 0014 | 9300 | 9410 | 3100 | 4a7c | 000c | 723c | 0000 | 0011 | d38c | 0000 | 0038 | b27c | b66c | 0000 | 09f4 | 0000 | 0a31 | 0011 | d390 | 0200 | 0db5 | 0500 | 1cdd |
| 2365140 | 0000 | 5bb7 | 0000 | 000b | 0000 | 3287 | 008a | 2d83 | 0000 | 033b | 0000 | 315f | 2c78 | 0080 | 0002 | 438a | 45d0 | 3364 | 4300 | 0000 | 0000 | 5ee7 | 0011 | ffe4 |
| 2365220 | 001c | 40a0 | 0012 | 0114 | 0018 | 332c | 3bf4 | 0000 | 0012 | 01bc | 0014 | 3244 | 4568 | 6d50 | 5370 | 320c | 4300 | 0000 | 0000 | 4837 | 0012 | 041c | 0010 | 4550 |
| 2365300 | 4b8c | 0000 | 0000 | 315f | 5370 | 42ac | 0000 | 4837 | 0012 | 0b40 | 0010 | 3310 | 4300 | 0000 | 0000 | 5ebf | 0010 | dfb4 | 0010 | 3d24 | 4240 | 0000 | 0000 | 617f |
| 2365360 | 242c | 0000 | 0011 | ffa0 | 0011 | d46c | 0000 | 0038 | b27c | b66c | 0000 | 09f5 | 0000 | 0a32 | 0011 | d470 | 0200 | 0db5 | 0500 | 1cdd | 0000 | 5be7 | 0000 | 0003 |
| 2365440 | 0000 | 3287 | 008a | 3783 | 0000 | 033b | 0000 | 315f | 2c78 | 00a8 | 0002 | 438a | 2520 | 332c | 4300 | 0000 | 0000 | 5edf | 0011 | ffe4 | 0020 | 3380 | 001c | 42ac |
| 2365520 | 0000 | 617f | 0011 | ffe4 | 0020 | 3310 | 4300 | 0000 | 0000 | 5ebf | 0010 | dfb4 | 0020 | 33f4 | 3e70 | 001c | 3b4c | 0000 | 0012 | 0bac | 001c | 3818 | 3ba0 | 0000 |
| 2365600 | 0012 | 0bcc | 001c | 3348 | 4108 | 0000 | 0012 | 0bec | 0018 | 3d3c | 3ba0 | 0000 | 0012 | 0c0c | 0014 | 3d30 | 4300 | 0000 | 0000 | 5edf | 0011 | ffa0 | 0010 | 4550 |
| 2365660 | 4b8c | 0000 | 0000 | 222f | 5370 | 42ac | 0000 | 4837 | 0012 | 0b40 | 0010 | 3d24 | 4240 | 0000 | 0000 | 617f | 242c | 0000 | 0011 | ffa0 | 0011 | d610 | 0000 | 0070 |
| 2365740 | b27c | b66c | 0000 | 09f6 | 0000 | 0a33 | 0011 | d4a8 | 0200 | 0db5 | 0500 | 1cdd | 0000 | 5bef | 0000 | 0003 | 0000 | 3287 | 008a | 3883 | 0000 | 033b | 0000 | 315f |
| 2366020 | 0011 | d610 | 0000 | 0038 | b27c | b66c | 0000 | 09f7 | 0000 | 0a34 | 0011 | d614 | 0200 | 0db5 | 0500 | 1cdd | 0000 | 5bdf | 0000 | 0003 | 0000 | 3287 | 008a | 3563 |

2366100 0000 033b 0000 315f 2c78 0134 0002 438a 2520 3380 001c 42ac 0000 5edf 0011 ffe4 0040 3310 4300 0000 0000 5ebf 0011 ffe4
2366160 0040 3380 003c 42ac 0000 617f 0011 ffe4 0040 3380 0038 42ac 0000 5ebf 0010 dfb4 0040 3410 0034 3e70 003c 411c 0000 0038
2366240 0012 0bac 0038 382c 0034 3c9c 0000 001c 0012 0bcc 0038 3380 002c 411c 0000 0034 0012 0bec 0034 382c 002c 3c9c 0000 001c
2366320 0012 0c0c 0034 3c9c 0000 001c 0012 0c40 0034 332c 4300 0000 0000 5edf 0011 ffe4 0034 3380 0030 39f8 0012 0c0c 0034 3410
2366400 0028 3e70 0030 411c 0000 002c 000d d784 002c 3228 3380 0024 40b4 0028 000d 7d78 0028 3380 0020 411c 0000 0024 000d d574
2366460 0024 3e70 0020 39a4 0012 0568 0020 3364 40b4 001c 0012 0c60 001c 3348 3ba0 0000 0012 0c60 001c 4538 6dd8 5370 4550 6d94
2366540 6b74 39a4 0012 0c80 0014 4073 0012 0c40 0010 3cf4 242c 0000 0012 0588 0011 d6c4 0000 0070 b27c b66c 0000 09f8 0000 0a35
2366620 0011 d64c 0200 0db5 0500 1cdd 0000 6187 0000 001b 0000 3287 0090 5d63 0000 033b 0000 315f 0011 d6c4 0000 0038 b27c b66c
2366700 0000 09f9 0000 0a36 0011 d6c8 0200 0db5 0500 1cdd 0000 6187 0000 0023 0000 3287 0090 6643 0000 033b 0000 315f 2954 0044
2366760 0002 438a 5818 6670 0018 5ec0 0000 0018 0200 61bf 67ec 0018 6bc8 5ec0 0000 0018 0200 0ad7 4b8c 0000 0000 2ad7 6b48 bfcc
2367040 a858 aaf0 ffff ac08 3050 22bc 0012 0cc8 0011 d760 0000 0070 b27c b66c 0000 09fa 0000 0a37 0011 d700 0200 0db5 0500 1cdd
2367120 0000 5c17 0000 000b 0000 3287 0090 6743 0000 033b 0000 315f 0011 d760 0000 0038 b27c b66c 0000 09fb 0000 0a38 0011 d764
2367200 0200 0db5 0500 1cdd 0000 5c17 0000 0013 0000 3287 008a 45e3 0000 033b 0000 315f 27f0 002c 0012 014c 45b8 46ec 32b8 247c
2367260 0012 0d08 0018 4580 6d94 5370 3d6c 37f0 3b4c 0000 0012 0d28 000c 2eb0 0011 d7fc 0000 0038 b27c b66c 0000 09fc 0000 0a39
2367340 0011 d800 0200 0db5 0500 1cdd 0000 5c17 0000 0023 0000 3287 0090 6943 0000 033b 0000 315f 2c78 0064 0002 438a 45b8 46ec
2367420 4790 001c 47e4 2ba0 0024 000e 3894 001c 2410 0000 0012 0d84 2c58 3348 3af4 001c 0012 0da4 0024 2e7c ae74 0020 2ba0 0024
2367500 0016 3818 3bf4 0000 000c 4138 0024 aa88 0020 2e98 c5a8 2c58 4580 6e1c 001c 6dd8 3d6c 2330 0012 0d28 0011 d888 0000 0038
2367560 b27c b66c 0000 09fd 0000 0a3a 0011 d88c 0200 0db5 0500 1cdd 0000 5c17 0000 001b 0000 3287 0090 6c23 0000 033b 0000 315f
2367640 2c78 0054 0002 438a 5d10 0000 0200 523f 67ec 001c 5f30 5b58 0200 61d7 6110 0018 4990 0018 2520 442c 0100 53a7 69b0 4408
2367720 0100 2927 6c84 001c 44a0 0000 0100 61df 6c84 0018 2400 0000 0012 0dc4 0010 2340 0012 0de4 0011 d994 0000 00e0 b27c b66c
2370000 0000 09fe 0000 0a3b 0011 d8c4 0200 0db5 0500 1cdd 0000 61e7 0000 000b 0000 3287 0090 6f23 0000 033b 0000 315f 0011 d8f8
2370060 0000 0038 b27c b66c 0000 09ff 0000 0a3c 0011 d8fc 0200 0db5 0500 1cdd 0000 60ef 0000 0013 0000 3287 0090 40c3 0000 033b
2370140 0000 315f 0011 d930 0000 0038 b27c b66c 0000 0a00 0000 0a3d 0011 d934 0200 0db5 0500 1cdd 0000 61f7 0000 001b 0000 3287
2370220 0090 75c3 0000 033b 0000 315f 0011 d994 0000 0038 b27c b66c 0000 0a01 0000 0a3e 0011 d998 0200 0db5 0500 1cdd 0000 601f
2370300 0000 000b 0000 3287 0090 1ba3 0000 033b 0000 315f 0027 7e6e 2a2a 2a20 4572 726f 723a 2055 6e64 6566 696e 6564 2076 6172
2370360 6961 626c 6520 227e 6122 2e7e 6e00 0000 0011 da2c 0000 0038 b27c b66c 0000 0a02 0000 0a3f 0011 da30 0200 0db5 0500 1cdd
2370440 0000 6037 0000 0013 0000 3287 0090 1fe3 0000 033b 0000 315f 27f0 0030 0011 d9f8 45c4 92a8 9410 3280 24d0 0000 0012 0acc
2370520 0014 37f0 3b4c 0000 0012 0aec 0010 4064 0012 08d8 000c 2eb0 2954 0030 0002 438a 45b8 46ec 9300 9860 32b8 247c 0012 029c
2370600 0018 4580 6d94 5370 3d6c 37f0 3b4c 0000 0012 0f34 000c 2eb0 0011 dac8 0000 0038 b27c b66c 0000 0a03 0000 0a40 0011 dacc
2370660 0200 0db5 0500 1cdd 0000 6037 0000 0023 0000 3287 0090 79a3 0000 033b 0000 315f 2c78 0064 0002 438a 45b8 46ec 4790 001c
2370740 47e4 2ba0 0024 000e 3894 001c 2410 0000 0012 0f54 2c58 3348 3af4 001c 0012 0da4 0024 2e7c ae74 0020 2ba0 0024 0016 3818
2371020 3bf4 0000 000c 4138 0024 aa88 0020 2e98 c5a8 2c58 4580 6e1c 001c 6dd8 3d6c 2330 0012 0f34 0011 db3c 0000 0038 b27c b66c
2371100 0000 0a04 0000 0a41 0011 db40 0200 0db5 0500 1cdd 0000 6037 0000 001b 0000 3287 0090 7aa3 0000 033b 0000 315f 2c78 003c
2371160 0002 438a 2520 46ec 4768 35c8 3280 247c 0012 0aec 0018 3804 3b4c 0000 0012 0b0c 0014 39a4 0012 08d8 0014 2ecc 37f0 3cf4
2371240 242c 0000 0012 0acc 0011 1c94 0000 0038 b27c b66c 0000 0a05 0000 0a42 0011 dc98 0200 0db5 0500 1cdd 0000 567f 0000 0013
2371320 0000 3287 0088 bba3 0000 033b 0000 315f 2c78 0120 0002 438a 2520 2e7c ac90 2ba0 000c 000a 48f8 a890 2e98 723c 2c58 4538
2371400 4b8c 0000 0000 039b 5370 4550 4b8c 0000 0000 0393 6b74 4538 4b8c 0000 0000 032b 6bb4 4550 4b8c 0000 0000 034b 6b74 4538
2371460 4b8c 0000 0000 0333 6bb4 4550 4b8c 0000 0000 034b 6b74 4538 4b8c 0000 0000 03a3 6bb4 4550 4b8c 0000 0000 0373 6b74 4538
2371540 4b8c 0000 0000 032b 6bb4 4550 4b8c 0000 0000 0323 6b74 4538 4b8c 0000 0000 034b 6bb4 4550 4b8c 0000 0000 0103 6b74 4538
2371620 4b8c 0000 0000 03a3 6bb4 4550 4b8c 0000 0000 0373 6b74 4538 4b8c 0000 0000 032b 6bb4 4550 4b8c 0000 0000 0393 6b74 4538
2371700 4b8c 0000 0000 032b 6bb4 4550 4b8c 0000 0000 0333 6b74 4538 4b8c 0000 0000 0333 6bb4 4550 4b8c 0000 0000 034b 6b74 4538
2371760 4b8c 0000 0000 0323 6bb4 234c 0012 03b4 0011 ddf8 0000 0138 b27c b66c 0000 0a06 0000 0a43 0011 ddfc 0200 0db5 0500 1cdd
2372040 0000 61cf 0000 0013 0000 3287 0090 6d23 0000 033b 0000 315f 0011 dd0c 0000 0040 0011 4970 0000 0000 0000 0000 0011 4af4
2372120 0000 0000 0000 0000 0000 0000 0000 0000 0011 4cd8 0000 0000 0000 0000 0011 4c38 0011 4bd4 0011 4b5c 0011 ddf8 0000 00c0
2372200 0011 4970 0000 0000 0000 0000 0000 0000 0000 0000 0000 0000 0011 4fb0 0000 0000 0000 0000 0000 0000 0000 0000 0011 5448
2372260 0000 0000 0000 0000 0000 0000 0000 0000 0000 0000 0000 0000 0000 0000 0011 4af4 0000 0000 0000 0000 0011 59f0 0011 587c
2372340 0000 0000 0000 0000 0000 0000 0000 0000 0000 0000 0000 0000 0011 5690 0000 0000 0000 0000 0000 0000 0000 0000 0000 0000
2372420 0011 580c 0000 0000 0000 0000 0011 5150 0000 0000 0011 56a0 000a dea9 0010 18cd 0011 53e0 0000 0000 2954 002c 0002 438a
2372500 2520 46ec 35c8 3280 24d0 0000 0012 0acc 0014 39a4 0012 08d8 0014 37f0 3cf4 234c 0012 0b0c 0011 de5c 0000 0038 b27c b66c
2372560 0000 0a07 0000 0a44 0011 de60 0200 0db5 0500 1cdd 0000 6217 0000 0013 0000 3287 0090 8383 0000 033b 0000 315f 2c78 002c
2372640 0002 438a 2520 46ec 35c8 3280 2410 0000 0012 0fc4 0014 39a4 0012 1090 0014 37f0 3cf4 234c 0012 0fe4 0011 ded8 0000 0038
2372720 b27c b66c 0000 0a08 0000 0a45 0011 dedc 0200 0db5 0500 1cdd 0000 6217 0000 001b 0000 3287 0090 8583 0000 033b 0000 315f
2373000 2c78 0044 0002 438a 2520 46ec 477c 35c8 3280 247c 0012 0fc4 001c 3818 32b8 247c 000c 4138 0018 3d3c 3b4c 0000 0012 10d0
2373060 0014 39a4 0012 1090 0014 37f0 3cf4 234c 0012 0fe4 0011 df4c 0000 0038 b27c b66c 0000 0a09 0000 0a46 000d fa3c 0200 0db5
2373140 0500 1cdd 0000 622f 0000 0013 0000 3287 0090 8783 0000 033b 0000 315f 2c78 001c 0002 438a 4550 6b48 5370 41d4 0000 6237

```
2373220  239c 0000 0008 c0fc 2c78 001c 0002 438a 45b8 46ec 3b4c 0000 0010 da8c 0014 2330 0010 dfb4 0011 c4ec 0011 e1f0 0000 002c
2373300  b288 b66c 0000 0a54 7fff ffff 0011 cffc 0200 0db5 0100 15ad 0100 33fd 0000 000b 0000 315f 0040 2f68 6f6d 652f 6f73 6173
2373360  312f 612f 7669 6a61 792f 5648 444c 2f70 6172 7365 722f 7072 6f6c 6f67 2f6e 6577 6e65 772f 7633 2e31 2f64 6174 6173 7472
2373440  7563 7475 7265 0079 0043 2f68 6f6d 652f 6f73 6173 312f 612f 7669 6a61 792f 5648 444c 2f70 6172 7365 722f 7072 6f6c 6f67
2373520  2f6e 6577 6e65 772f 7633 2e31 2f64 6174 6173 7472 7563 7475 7265 2e70 6c00 0a25 003b 2f68 6f6d 652f 6f73 6173 312f 612f
2373600  7669 6a61 792f 5648 444c 2f70 6172 7365 722f 7072 6f6c 6f67 2f6e 6577 6e65 772f 7633 2e31 2f64 6174 6162 6173 6500 2525
2373660  003e 2f68 6f6d 652f 6f73 6173 312f 612f 7669 6a61 792f 5648 444c 2f70 6172 7365 722f 7072 6f6c 6f67 2f6e 6577 6e65 772f
2373740  7633 2e31 2f64 6174 6162 6173 652e 706c 0061 6e74 0038 2f68 6f6d 652f 6f73 6173 312f 612f 7669 6a61 792f 5648 444c 2f70
2374020  6172 7365 722f 7072 6f6c 6f67 2f6e 6577 6e65 772f 7633 2e31 2f73 7461 636b 0028 003b 2f68 6f6d 652f 6f73 6173 312f 612f
2374100  7669 6a61 792f 5648 444c 2f70 6172 7365 722f 7072 6f6c 6f67 2f6e 6577 6e65 772f 7633 2e31 2f73 7461 636b 2e70 6c00 7374
2374160  003a 2f68 6f6d 652f 6f73 6173 312f 612f 7669 6a61 792f 5648 444c 2f70 6172 7365 722f 7072 6f6c 6f67 2f6e 6577 6e65 772f
2374240  7633 2e31 2f61 6c69 6173 6573 0062 2843 003d 2f68 6f6d 652f 6f73 6173 312f 612f 7669 6a61 792f 5648 444c 2f70 6172 7365
2374320  722f 7072 6f6c 6f67 2f6e 6577 6e65 772f 7633 2e31 2f61 6c69 6173 6573 2e70 6c00 0000 002c 0012 144c b27c b66c 0000 0a57
2374400  7fff ffff 0011 bf28 0200 0db5 0200 2f35 0000 62d7 0000 0343 0000 315f 0000 002c 0012 1478 b27c b66c 0000 0ab3 7fff ffff
2374460  0011 bf54 0200 0db5 0200 224d 0000 62d7 0000 3287 0000 315f 0010 6461 7461 7374 7275 6374 7572 652e 706c 0000 0011 e370
2374540  0000 0138 b27c b66c 0000 0a59 0000 0ab2 000a d16d 0200 0db5 0200 270d 0000 62d7 0000 3287 0000 315f 0011 e254 0000 0038
2374620  b27c b66c 0000 0a5a 0000 0ab4 0011 e284 0200 0db5 0500 1cdd 0000 630f 0000 0023 0000 3287 0091 a2e3 0000 0343 0000 315f
2374700  0011 e280 0000 002c b4f0 b4e4 0000 0a59 7fff ffff 0008 b0dd 0000 0000 0000 0000 0011 fb40 0002 438a 0012 51b0 0011 e2b8
2374760  0000 0038 b27c b66c 0000 0a5b 0000 0ab5 0011 e2bc 0200 0db5 0500 1cdd 0000 5ed7 0000 0073 0000 3287 0091 a3e3 0000 0343
2375040  0000 315f 0011 e2f0 0000 0038 b27c b66c 0000 0a5c 0000 0ab6 0011 e2f4 0200 0db5 0500 1cdd 0000 5ed7 0000 000b 0000 3287
2375120  0090 7d23 0000 0343 0000 315f 0011 e370 0000 0038 b27c b66c 0000 0a5d 0000 0ab7 0011 e374 0200 0db5 0500 1cdd 0000 620f
2375200  0000 0013 0000 3287 0090 7f23 0000 0343 0000 315f 2c78 0048 0002 438a 5d10 0000 0e00 5ed7 671c 5fb4 0034 5aec 0100 61bf
2375260  5a18 0000 0200 0ad7 4b8c 0000 0000 6317 671c 5b58 0100 61bf 5a18 0000 0200 0ad7 4b8c 0000 0000 6317 6b74 228c 0011 e804
2375340  0000 0440 b27c b66c 0000 0a5e 0000 0ab8 0011 e3ac 0200 0db5 0500 1cdd 0000 6227 0000 0013 0000 3287 0090 8683 0000 0343
2375420  0000 315f 0011 e3e0 0000 0038 b27c b66c 0000 0a5f 0000 0ab9 0011 e3e4 0200 0db5 0500 1cdd 0000 6207 0000 0013 0000 3287
2375500  0090 7e23 0000 0343 0000 315f 0011 e418 0000 0038 b27c b66c 0000 0a60 0000 0aba 0011 e41c 0200 0db5 0500 1cdd 0000 6267
2375560  0000 0013 0000 3287 0090 90c3 0000 0343 0000 315f 0011 e450 0000 0038 b27c b66c 0000 0a61 0000 0abb 0011 e454 0200 0db5
2375640  0500 1cdd 0000 631f 0000 0013 0000 3287 0091 af83 0000 0343 0000 315f 0011 e488 0000 0038 b27c b66c 0000 0a62 0000 0abc
2375720  0011 e48c 0200 0db5 0500 1cdd 0000 6327 0000 0013 0000 3287 0091 b2a3 0000 0343 0000 315f 0011 e4c0 0000 0038 b27c b66c
2376000  0000 0a63 0000 0abd 0011 e504 0200 0db5 0500 1cdd 0000 632f 0000 0013 0000 3287 0091 b6a3 0000 0343 0000 315f 0011 e4f8
2376060  0000 0038 b27c b66c 0000 0a6c 0000 0ac6 0011 e744 0200 0db5 0500 1cdd 0000 5ebf 0000 0053 0000 3287 0091 d503 0000 0343
2376140  0000 315f 0011 e500 0000 0008 0011 e538 0000 0038 b27c b66c 0000 0a64 0000 0abe 0011 e53c 0200 0db5 0500 1cdd 0000 6337
2376220  0000 0013 0000 3287 0091 b8e3 0000 0343 0000 315f 0011 e570 0000 0038 b27c b66c 0000 0a65 0000 0abf 0011 e574 0200 0db5
2376300  0500 1cdd 0000 633f 0000 0013 0000 3287 0091 bcc3 0000 0343 0000 315f 0011 e5a8 0000 0038 b27c b66c 0000 0a66 0000 0ac0
2376360  0011 e5ac 0200 0db5 0500 1cdd 0000 6347 0000 0013 0000 3287 0091 c0c3 0000 0343 0000 315f 0011 e5e0 0000 0038 b27c b66c
2376440  0000 0a67 0000 0ac1 0011 e5e4 0200 0db5 0500 1cdd 0000 634f 0000 0013 0000 3287 0091 c4a3 0000 0343 0000 315f 0011 e618
2376520  0000 0038 b27c b66c 0000 0a68 0000 0ac2 0011 e61c 0200 0db5 0500 1cdd 0000 6357 0000 0013 0000 3287 0091 c883 0000 0343
2376600  0000 315f 0011 e650 0000 0038 b27c b66c 0000 0a69 0000 0ac3 0011 e654 0200 0db5 0500 1cdd 0000 6367 0000 0013 0000 3287
2376660  0091 cc43 0000 0343 0000 315f 0011 e688 0000 0038 b27c b66c 0000 0a6a 0000 0ac4 0011 e68c 0200 0db5 0500 1cdd 0000 6377
2376740  0000 0013 0000 3287 0091 d043 0000 0343 0000 315f 0011 e6c0 0000 0038 b27c b66c 0000 0a6b 0000 0ac5 0011 e4c4 0200 0db5
2377020  0500 1cdd 0000 637f 0000 0013 0000 3287 0091 d403 0000 0343 0000 315f 0011 e6f8 0000 0038 b27c b66c 0000 0a7e 0000 0ad8
2377100  0011 e6fc 0200 0db5 0500 1cdd 0000 63b7 0000 0013 0000 3287 0091 fda3 0000 0343 0000 315f 0011 e730 0000 0038 b27c b66c
2377160  0000 0a7f 0000 0ad9 0011 ecd0 0200 0db5 0500 1cdd 0000 60d7 0000 0013 0000 3287 0090 3be3 0000 0343 0000 315f 0011 e740
2377240  0000 0010 0011 e700 0000 0000 0011 e778 0000 0038 b27c b66c 0000 0a6d 0000 0ac7 0011 e77c 0200 0db5 0500 1cdd 0000 5ebf
2377320  0000 000b 0000 3287 0090 8103 0000 0343 0000 315f 0011 e804 0000 0038 b27c b66c 0000 0a6e 0000 0ac8 0011 e808 0200 0db5
2377400  0500 1cdd 0000 6067 0000 0013 0000 3287 0090 2843 0000 0343 0000 315f 2c78 0054 0002 438a 5d10 0000 0a00 5ebf 671c 5fb4
2377460  0018 6784 5f8c 5aec 0200 61bf 671c 6bf4 5d10 0000 0200 0ad7 4b8c 0000 0000 2ad7 671c 5b58 0200 61bf 6750 6bf4 5d7c 0000
2377540  0200 0ad7 4b8c 0000 0000 2ad7 6b74 228c 0011 ea60 0000 0230 b27c b66c 0000 0a6f 0000 0ac9 0011 e840 0200 0db5 0500 1cdd
2377620  0000 605f 0000 0013 0000 3287 0090 2743 0000 0343 0000 315f 0011 e874 0000 0038 b27c b66c 0000 0a70 0000 0aca 0011 e878
2377700  0200 0db5 0500 1cdd 0000 6387 0000 0013 0000 3287 0091 db63 0000 0343 0000 315f 0011 e8ac 0000 0038 b27c b66c 0000 0a71
2377760  0000 0acb 0011 e8b0 0200 0db5 0500 1cdd 0000 638f 0000 0013 0000 3287 0091 de83 0000 0343 0000 315f 0011 e8e4 0000 0038
2400040  b27c b66c 0000 0a72 0000 0acc 0011 e8e8 0200 0db5 0500 1cdd 0000 607f 0000 0013 0000 3287 0090 2a43 0000 0343 0000 315f
2400120  0011 e91c 0000 0038 b27c b66c 0000 0a73 0000 0acd 0011 e920 0200 0db5 0500 1cdd 0000 6087 0000 0013 0000 3287 0090 2b43
2400200  0000 0343 0000 315f 0011 e954 0000 0038 b27c b66c 0000 0a74 0000 0ace 0011 e958 0200 0db5 0500 1cdd 0000 6397 0000 0013
2400260  0000 3287 0091 e6a3 0000 0343 0000 315f 0011 e98c 0000 0038 b27c b66c 0000 0a75 0000 0acf 0011 e990 0200 0db5 0500 1cdd
```

```
2400340  0000 6137 0000 0013 0000 3287 0090 4bc3 0000 0343 0000 315f 0011 e9c4 0000 0038 b27c b66c 0000 0a76 0000 0ad0 0011 e9c8
2400420  0200 0db5 0500 1cdd 0000 639f 0000 0013 0000 3287 0091 ece3 0000 0343 0000 315f 0011 e9fc 0000 0038 b27c b66c 0000 0a77
2400500  0000 0ad1 0011 ea00 0200 0db5 0500 1cdd 0000 63a7 0000 0013 0000 3287 0091 f103 0000 0343 0000 315f 0011 ea60 0000 0038
2400560  b27c b66c 0000 0a78 0000 0ad2 0011 ea64 0200 0db5 0500 1cdd 0000 6127 0000 0013 0000 3287 0090 43c3 0000 0343 0000 315f
2400640  2c78 002c 0002 438a 44c4 0000 0200 0ad7 4b8c 0000 0000 2ad7 6b88 43e4 0200 61bf 6bf4 5fa0 239c 0000 0012 0503 0011 eb5c
2400720  0000 00a8 b27c b66c 0000 0a79 0000 0a13 0011 ea9c 0200 0db5 0500 1cdd 0000 63af 0000 0053 0000 3287 0091 f423 0000 0343
2401000  0000 315f 0011 ead0 0000 0038 b27c b66c 0000 0a7a 0000 0ad4 0011 ead4 0200 0db5 0500 1cdd 0000 63af 0000 000b 0000 3287
2401060  0091 f523 0000 0343 0000 315f 0011 eb5c 0000 0038 b27c b66c 0000 0a7b 0000 0ad5 0011 eb60 0200 0db5 0500 1cdd 0000 60af
2401140  0000 0013 0000 3287 0090 3443 0000 0343 0000 315f 2c78 0054 0002 438a 5d10 0000 0a00 63af 671c 5fb4 0014 6784 5f78 5aec
2401220  0200 61bf 671c 6bf4 5d10 0000 0200 0ad7 4b8c 0000 0000 5ec7 671c 5b58 0200 61bf 6750 6bf4 5d7c 0000 0200 0ad7 4b8c 0000
2401300  0000 5ec7 6b74 228c 0011 eccc 0000 0150 b27c b66c 0000 0a7c 0000 0ad6 0011 eb98 0200 0db5 0500 1cdd 0000 6097 0000 0013
2401360  0000 3287 0090 3143 0000 0343 0000 315f 0011 ebcc 0000 0038 b27c b66c 0000 0a7d 0000 0ad7 0011 e6c4 0200 0db5 0500 1cdd
2401440  0200 60cf 0000 0013 0000 3287 0090 39a3 0000 0343 0000 315f 0011 ec04 0000 0038 b27c b66c 0000 0aa0 0000 0afa 0011 ec08
2401520  0200 0db5 0500 1cdd 0000 643f 0000 0013 0000 3287 0092 5723 0000 0343 0000 315f 0011 ec3c 0000 0038 b27c b66c 0000 0aa1
2401600  0000 0afb 0011 ec40 0200 0db5 0500 1cdd 0000 6447 0000 0013 0000 3287 0092 5ae3 0000 0343 0000 315f 0011 ec74 0000 0038
2401660  b27c b66c 0000 0aa2 0000 0afc 0011 ec78 0200 0db5 0500 1cdd 0000 644f 0000 0013 0000 3287 0092 5f63 0000 0343 0000 315f
2401740  0011 eccc 0000 0038 b27c b66c 0000 0aa3 0000 0afd 0011 f6fc 0200 0db5 0500 1cdd 0000 6457 0000 0013 0000 3287 0092 6323
2402020  0000 0343 0000 315f 0010 d66c 0200 645f 0000 3287 0000 0009 0012 4c90 0012 4c90 0001 0068 0000 0000 0011 ee48 0000 0150
2402100  b27c b66c 0000 0a80 0000 0ada 0011 ed08 0200 0db5 0500 1cdd 0000 610f 0000 0013 0000 3287 0090 44c3 0000 0343 0000 315f
2402160  0011 ed3c 0000 0038 b27c b66c 0000 0a81 0000 0adb 0011 ed40 0200 0db5 0500 1cdd 0000 609f 0000 0013 0000 3287 0090 3243
2402240  0000 0343 0000 315f 0011 ed74 0000 0038 b27c b66c 0000 0a82 0000 0adc 0011 ed78 0200 0db5 0500 1cdd 0000 60a7 0000 0013
2402320  0000 3287 0090 3343 0000 0343 0000 315f 0011 edac 0000 0038 b27c b66c 0000 0a83 0000 0add 0011 edb0 0200 0db5 0500 1cdd
2402400  0000 63bf 0000 0013 0000 3287 0092 0a43 0000 0343 0000 315f 0011 ede4 0000 0038 b27c b66c 0000 0a84 0000 0ade 0011 ede8
2402460  0200 0db5 0500 1cdd 0000 63c7 0000 0013 0000 3287 0092 0e43 0000 0343 0000 315f 0011 ee48 0000 0038 b27c b66c 0000 0a85
2402540  0000 0adf 0011 ee4c 0200 0db5 0500 1cdd 0000 613f 0000 0013 0000 3287 0090 4de3 0000 0343 0000 315f 2c78 002c 0002 438a
2402620  44c4 0000 0200 0ad7 4b8c 0000 0000 5ec7 6b88 43e4 0200 61bf 6bf4 5fa0 239c 0000 0012 0688 0011 ef44 0000 00a8 b27c b66c
2402700  0000 0a86 0000 0ae0 0011 ee84 0200 0db5 0500 1cdd 0000 32e7 0000 0033 0000 3287 0092 1163 0000 0343 0000 315f 0011 eeb8
2402760  0000 0038 b27c b66c 0000 0a87 0000 0ae1 0011 eebc 0200 0db5 0500 1cdd 0000 32e7 0000 000b 0000 3287 0092 1263 0000 0343
2403040  0000 315f 0011 ef44 0000 0038 b27c b66c 0000 0a88 0000 0ae2 0011 ef48 0200 0db5 0500 1cdd 0000 615f 0000 0013 0000 3287
2403120  0090 5663 0000 0343 0000 315f 2c78 0054 0002 438a 5d10 0000 0600 32e7 671c 5f8c 6784 5f8c 5d10 0000 0200 61bf 671c 6bf4
2403200  5d10 0000 0200 0ad7 4b8c 0000 0000 32cf 671c 5b58 0200 61bf 6750 6bf4 5d7c 0000 0200 0ad7 4b8c 0000 0000 32cf 6b74 228c
2403260  0011 f0c0 0000 0150 b27c b66c 0000 0a89 0000 0ae3 0011 ef80 0200 0db5 0500 1cdd 0000 63cf 0000 0013 0000 3287 0092 16a3
2403340  0000 0343 0000 315f 0011 efb4 0000 0038 b27c b66c 0000 0a8a 0000 0ae4 0011 efb8 0200 0db5 0500 1cdd 0000 63d7 0000 0013
2403420  0000 3287 0092 1aa3 0000 0343 0000 315f 0011 efec 0000 0038 b27c b66c 0000 0a8b 0000 0ae5 0011 eff0 0200 0db5 0500 1cdd
2403500  0000 616f 0000 0013 0000 3287 0090 5863 0000 0343 0000 315f 0011 f024 0000 0038 b27c b66c 0000 0a8c 0000 0ae6 0011 f028
2403560  0200 0db5 0500 1cdd 0000 6167 0000 0013 0000 3287 0090 5763 0000 0343 0000 315f 0011 f05c 0000 0038 b27c b66c 0000 0a8d
2403640  0000 0ae7 0011 f060 0200 0db5 0500 1cdd 0000 63df 0000 0013 0000 3287 0092 2363 0000 0343 0000 315f 0011 f0c0 0000 0038
2403720  b27c b66c 0000 0a9e 0000 0ae8 0011 f0c4 0200 0db5 0500 1cdd 0000 63e7 0000 0013 0000 3287 0092 2723 0000 0343 0000 315f
2404000  2c78 002c 0002 438a 44c4 0000 0200 0ad7 4b8c 0000 0000 32cf 6b88 43e4 0200 61bf 6bf4 5fa0 239c 0000 0012 0acc 0011 f424
2404060  0000 0310 b27c b66c 0000 0a8f 0000 0ae9 0011 f0fc 0200 0db5 0500 1cdd 0000 53a7 0000 004b 0000 3287 0092 2823 0000 0343
2404140  0000 315f 0011 f130 0000 0038 b27c b66c 0000 0a90 0000 0aea 0011 f134 0200 0db5 0500 1cdd 0000 53a7 0000 000b 0000 3287
2404220  0092 2923 0000 0343 0000 315f 0011 f168 0000 0038 b27c b66c 0000 0a91 0000 0aeb 0011 f16c 0200 0db5 0500 1cdd 0000 31bf
2404300  0000 0013 0000 3287 0092 2c23 0000 0343 0000 315f 0011 f1a0 0000 0038 b27c b66c 0000 0a92 0000 0aec 0011 f1a4 0200 0db5
2404360  0500 1cdd 0000 63ef 0000 0013 0000 3287 0092 2fe3 0000 0343 0000 315f 0011 f1d8 0000 0038 b27c b66c 0000 0a93 0000 0aed
2404440  0011 f1dc 0200 0db5 0500 1cdd 0000 63f7 0000 0013 0000 3287 0092 33c3 0000 0343 0000 315f 0011 f210 0000 0038 b27c b66c
2404520  0000 0a94 0000 0aee 0011 f214 0200 0db5 0500 1cdd 0000 63ff 0000 0013 0000 3287 0092 36e3 0000 0343 0000 315f 0011 f248
2404600  0000 0039 b27c b66c 0000 0a95 0000 0aef 0011 f24c 0200 0db5 0500 1cdd 0000 6407 0000 0013 0000 3287 0092 3a03 0000 0343
2404660  0000 315f 0011 f280 0000 0038 b27c b66c 0000 0a96 0000 0af0 0011 f284 0200 0db5 0500 1cdd 0000 640f 0000 0013 0000 3287
2404740  0092 3d23 0000 0343 0000 315f 0011 f2b8 0000 0038 b27c b66c 0000 0a97 0000 0af1 0011 f2bc 0200 0db5 0500 1cdd 0000 6417
2405020  0000 0013 0000 3287 0092 4043 0000 0343 0000 315f 0011 f2f0 0000 0038 b27c b66c 0000 0a98 0000 0af2 0011 f2f4 0200 0db5
2405100  0500 1cdd 0000 641f 0000 0013 0000 3287 0092 4363 0000 0343 0000 315f 0011 f328 0000 0038 b27c b66c 0000 0a99 0000 0af3
2405160  0011 f32c 0200 0db5 0500 1cdd 0000 6427 0000 0013 0000 3287 0092 4763 0000 0343 0000 315f 0011 f360 0000 0038 b27c b66c
2405240  0000 0a9a 0000 0af4 0011 f364 0200 0db5 0500 1cdd 0000 642f 0000 003b 0000 3287 0092 4a83 0000 0343 0000 315f 0011 f398
2405320  0000 0038 b27c b56c 0000 0a9b 0000 0af5 0011 f39c 0200 0db5 0500 1cdd 0000 1ff7 0000 000b 0000 3287 0092 4b83 0000 0343
2405400  0000 315f 0011 f424 0000 0038 b27c b66c 0000 0a9c 0000 0af6 0011 f428 0200 0db5 0500 1cdd 0000 61ef 0000 0013 0000 3287
```

```
2405460  0090 7403 0000 0343 0000 315f 2c78 0054 0002 438a 5d10 0000 0700 642f 671c 5f64 6784 5fa0 5d10 0000 0200 61bf 671c 6bf4
2405540  5d10 0000 0200 0ad7 4b8c 0000 0000 1e9f 671c 5b58 0200 61bf 6750 6bf4 5d7c 0000 0200 0ad7 4b8c 0000 0000 1e9f 6b74 228c
2405620  0011 f6f8 0000 02a8 b27c b66c 0000 0a9d 0000 0af7 0011 f460 0200 0db5 0500 1cdd 0000 60ff 0000 0013 0000 3287 0090 42c3
2405700  0000 0343 0000 315f 0011 f494 0000 0038 b27c b66c 0000 0a9e 0000 0af8 0011 f498 0200 0db5 0500 1cdd 0000 60f7 0000 0013
2405760  0000 3287 0090 41c3 0000 0343 0000 315f 0011 f4cc 0000 0038 b27c b66c 0000 0a9f 0000 0af9 0011 ebd0 0200 0db5 0500 1cdd
2406040  0000 6437 0000 0013 0000 3287 0092 5403 0000 0343 0000 315f 0011 f54c 0000 0080 0011 3a44 0000 0000 0000 0000 0000 0000
2406120  0000 0000 0000 0000 0011 3e30 0011 3dec 0011 347c 0011 3d54 0000 0000 0011 3c90 0011 3c44 0000 0000 0011 3c34 0011 3b90
2406200  0011 3a8c 0011 3978 0011 3894 0011 3830 0000 0000 0011 37e4 0000 0000 0000 0000 0000 0000 0011 39e0 0011 39bc 0000 0000
2406260  0000 0000 0000 0000 0011 f6f8 0000 0180 0011 3a44 0000 0000 0011 6064 0000 0000 0011 5d64 0011 4914 0000 0000 0000 0000
2406340  0000 0000 0011 489c 0011 4760 0011 4770 0000 0000 0000 0000 0000 0000 0000 0000 0000 0000 0000 0000 0000 0000 0000 0000
2406420  0000 0000 0011 44d4 0000 0000 0000 0000 0000 0000 0000 0000 0000 0000 0011 40c8 0000 0000 0000 0000 0000 0000 0000 0000
2406500  0000 0000 0000 0000 0000 0000 0000 0000 0000 0000 0000 0000 0000 0000 0000 0000 0000 0000 0000 0000 0000 0000 0000 0000
*
2406640  0000 0000 0000 0000 0011 4904 0000 0000 0000 0000 0000 0000 0000 0000 0000 0000 0000 0000 0000 0000 0000 0000 0000 0000
2406720  0000 0000 0000 0000 0000 0000 0000 0000 0000 0000 0000 0000 0000 0000 0000 0000 0000 0000 0000 0000 0011 580c 0011 5994
2407000  0011 5b9c 0011 5f48 000a 32c9 0011 6088 0011 63ac 0011 664c 0011 65d0 0011 47ec 0011 4780 0011 468c 0011 4600 0011 4490
2407060  000a 38b9 0011 4420 2c78 002c 0002 438a 44c4 0000 0200 0ad7 4b8c 0000 0000 1e9f 6b88 43e4 0200 61bf 6bf4 5fa0 239c 0000
2407140  0012 0e80 0011 f75c 0000 0038 b27c b66c 0000 0aa4 0000 0afe 0011 f760 0200 0db5 0500 1cdd 0000 645f 0000 0013 0000 3287
2407220  008f 65c3 0000 0343 0000 315f 2c78 002a 0002 438a 5d10 0000 0200 61bf 671c 5fa0 5d10 0000 0200 0ad7 4b8c 0000 0000 6467
2407300  671c 48f8 228c 2525 0011 f7f8 0000 0070 b27c b66c 0000 0aa5 0000 0aff 0011 f798 0200 0db5 0500 1cdd 0000 646f 0000 0013
2407360  0000 3287 0092 6703 0000 0343 0000 315f 0011 f7f8 0000 0038 b27c b56c 0000 0aa6 0000 0b00 0011 f7fc 0200 0db5 0500 1cdd
2407440  0000 6477 0000 0013 0000 3287 0092 6b23 0000 0343 0000 315f 2c78 002a 0002 438a 5d10 0000 0200 61bf 671c 5fa0 5d10 0000
2407520  0200 0ad7 4b8c 0000 0000 647f 671c 48f8 228c 0972 0011 fb3c 0000 01f8 b27c b66c 0000 0aa7 0000 0b01 0011 f834 0200 0db5
2407600  0500 1cdd 0000 6487 0000 0013 0000 3287 0092 6e03 0000 0343 0000 315f 0011 f868 0000 0038 b27c b66c 0000 0aa8 0000 0b02
2407660  0011 f86c 0200 0db5 0500 1cdd 0000 648f 0000 000b 0000 3287 0092 7183 0000 0343 0000 315f 0011 f8a0 0000 0038 b27c b66c
2407740  0000 0aa9 0000 0b03 0011 f8a4 0200 0db5 0500 1cdd 0000 6497 0000 000b 0000 3287 0092 74e3 0000 0343 0000 315f 0011 f8d8
2410020  0000 0038 b27c b66c 0000 0aaa 0000 0b04 0011 f9dc 0200 0db5 0500 1cdd 0000 6117 0000 000b 0000 3287 0090 45c3 0000 0343
2410100  0000 315f 0011 f910 0000 0038 b27c b66c 0000 0aab 0000 0b05 0011 f914 0200 0db5 0500 1cdd 0000 60df 0000 000b 0000 3287
2410160  0090 3ec3 0000 0343 0000 315f 0011 f948 0000 0038 b27c b66c 0000 0aac 0000 0b06 0011 f94c 0200 0db5 0500 1cdd 0000 60e7
2410240  0000 000b 0000 3287 0090 3fc3 0000 0343 0000 315f 0011 f980 0000 0038 b27c b66c 0000 0aad 0000 0b07 0011 f984 0200 0db5
2410320  0500 1cdd 0000 649f 0000 000b 0000 3287 0092 8083 0000 0343 0000 315f 0011 f9b8 0000 0038 b27c b66c 0000 0aae 0000 0b08
2410400  0011 f9bc 0200 0db5 0500 1cdd 0000 64a7 0000 000b 0000 3287 0092 8403 0000 0343 0000 315f 0011 fb3c 0000 0038 b27c b66c
2410460  0000 0aaf 0000 0b09 0011 fb40 0200 0db5 0500 1cdd 0000 64af 0000 0013 0000 3287 0092 8783 0000 0343 0000 315f 27f0 002c
2410540  0011 fa18 4e1c 0000 0000 5ed7 537c 0000 0100 61bf 5a18 0000 0200 0ad7 4b8c 0000 0000 6317 5fa0 228c 28c4 0030 0011 fa48
2410620  4e1c 0000 0000 5ebf 5d7c 0000 0200 61bf 671c 5fa0 5d10 0000 0200 0ad7 4b8c 0000 0000 2ad7 5fa0 228c 28c4 0030 0011 fa78
2410700  4e1c 0000 0000 53af 5d7c 0000 0200 61bf 671c 5fa0 5d10 0000 0200 0ad7 4b8c 0000 0000 5ec7 5fa0 228c 28c4 0030 0011 faa8
2410760  4e1c 0000 0000 32e7 5d7c 0000 0200 61bf 671c 5fa0 5d10 0000 0200 0ad7 4b8c 0000 0000 32cf 5fa0 228c 28c4 0030 0011 fad8
2411040  4e1c 0000 0000 1ff7 5d7c 0000 0200 61bf 671c 5fa0 5d10 0000 0200 0ad7 4b8c 0000 0000 1e9f 5fa0 228c 28c4 0030 0011 fb08
2411120  4e1c 0000 0000 5ef7 5d7c 0000 0200 61bf 671c 5fa0 5d10 0000 0200 0ad7 4b8c 0000 0000 6467 5fa0 228c 2954 0030 0002 438a
2411200  4e1c 0000 0000 64b7 5d7c 0000 0200 61bf 671c 5fa0 5d10 0000 0200 0ad7 4b8c 0000 0000 647f 5fa0 228c 0011 fc74 0000 0038
2411260  b130 b66c 0000 0ab0 0000 0b0a 0011 e259 0200 0db5 0500 1cdd 0000 64bf 0000 0003 0000 3287 0092 8ba3 0000 0343 0000 315f
2411340  2c78 0100 0002 438a 2520 43e4 0e00 5ed7 5fb4 0038 447c 0000 0200 0daf 4b8c 0000 0000 3287 6bb4 247c 0008 db9c 000c 43e4
2411420  0a00 5ebf 5fb4 0028 447c 0000 0200 0daf 4b8c 0000 0000 3287 6bb4 247c 0008 db9c 000c 43e4 0a00 63af 5fb4 0028 447c 0000
2411500  0200 0daf 4b8c 0000 0000 3287 6bb4 247c 0008 db9c 000c 43e4 0600 32e7 5fb4 0018 447c 0000 0200 0daf 4b8c 0000 0000 3287
2411560  6bb4 247c 0008 db9c 000c 43e4 0900 53a7 5fb4 0024 447c 0000 0200 0daf 4b8c 0000 0000 3287 6bb4 247c 0008 db9c 000c 43e4
2411640  0700 642f 5fb4 001c 447c 0000 0200 0daf 4b8c 0000 0000 3287 6bb4 247c 0008 db9c 000c 43e4 0400 630f 5f64 43c0 0200 0daf
2411720  4b8c 0000 0000 3287 6bb4 234c 0008 db9c 0012 14b4 0000 02e0 000a 33d1 0011 3978 0011 3894 0011 3830 0000 0000 0011 37e4
2412000  0000 0000 0000 0000 0000 0000 0011 39e0 0011 39bc 0000 0000 0000 0000 0000 0000 0011 fd74 0000 00c0 0011 3a8c 0011 3978
2412060  0011 3894 0011 3830 0000 0000 0011 37e4 0000 0000 0000 0000 0000 0000 0011 39e0 0011 39bc 0000 0000 0011 3ffc 0011 406c
2412140  0000 0000 0000 0000 0011 3a44 0000 0000 0000 0000 0000 0000 0000 0000 0000 0000 0000 0000 0000 0000 0000 0000 0000 0000
2412220  0000 0000 0000 0000 0000 0000 0000 0000 0000 0000 0000 0000 0000 0000 0000 0000 0000 0000 0000 0000 0000 0000 0011 44d4
2412300  0000 0000 0000 0000 0000 0000 0000 0000 0000 0000 0010 18cd 000a 38b9 0011 4420 0012 14e0 0000 01e0 6c65 6761 6c5f 6172
2412360  7261 7928 6172 7261 7928 5f2c 5f29 2c20 5f29 203a 2d0a 0966 6169 6c2e 0a0a 6c65 6761 6c5f 6172 7261 7928 4172 7261 792c
2412440  2052 6566 6572 656e 6365 2c20 5374 6174 652c 2053 7461 7465 7356 6973 6974 6564 2920 3a2d 0a09 280a 0920 2020 206c 6567
2412520  616c 5f61 7272 6179 2841 7272 6179 2c20 5265 6665 7265 6e63 652c 2053 7461 7465 290a 093b 0a09 2020 2020 7061 7265 6e74
```

| | | | | | | | | | | | | | | | | | | | | | | | | |
|---|---|---|---|---|---|---|---|---|---|---|---|---|---|---|---|---|---|---|---|---|---|---|---|---|
| 2412600 | 5f6f | 6628 | 5374 | 6174 | 652c | 2050 | 6172 | 656e | 7453 | 7461 | 7465 | 292c | 0a09 | 2020 | 2020 | 5c2b | 206d | 656d | 6265 | 7228 | 5061 | 7265 | 6e74 | 5374 |
| 2412660 | 6174 | 652c | 2053 | 7461 | 7465 | 7356 | 6973 | 6974 | 6564 | 292c | 0a09 | 2020 | 2020 | 6c65 | 6761 | 6c5f | 6172 | 7261 | 7928 | 4172 | 7261 | 792c | 2052 | 6566 |
| 2412740 | 6572 | 656e | 6365 | 2c20 | 5061 | 7265 | 6e74 | 5374 | 6174 | 652c | 205b | 5374 | 6174 | 657c | 5374 | 6174 | 6573 | 5669 | 7369 | 7465 | 645d | 290a | 0929 | 2e0a |
| 2413020 | 0a6c | 6567 | 616c | 5f61 | 7272 | 6179 | 2861 | 7272 | 6179 | 284e | 616d | 652c | 205f | 292c | 2072 | 6566 | 6572 | 2856 | 6172 | 4964 | 2c20 | 5374 | 6174 | 6529 |
| 2413100 | 2c20 | 5374 | 6174 | 6529 | 203a | 2d0a | 0976 | 6172 | 6961 | 626c | 6528 | 5661 | 7249 | 642c | 2064 | 6563 | 6c61 | 7265 | 645f | 696e | 2853 | 7461 | 7465 | 292c |
| 2413160 | 206e | 616d | 6528 | 4e61 | 6d65 | 292c | 2074 | 7970 | 6528 | 5479 | 7065 | 2929 | 2c0a | 0961 | 7272 | 6179 | 5f74 | 7970 | 6528 | 5479 | 7065 | 292e | 0a0a | 2525 |
| 2413240 | 2052 | 6577 | 7269 | 7465 | 2074 | 6869 | 7320 | 636c | 6175 | 7365 | 2077 | 6865 | 6e20 | 7661 | 7269 | 6162 | 000f | cfc0 | 0200 | 2027 | 0000 | 3287 | 0000 | 0008 |
| 2413320 | 000a | 18f0 | 0002 | 438a | 0003 | 0067 | 0000 | 0000 | 000c | 8ba4 | 0200 | 5f7f | 0000 | 3287 | 0000 | 0008 | 0012 | 831c | 0012 | 831c | 0001 | 006b | 0000 | 0000 |
| 2413400 | 000c | 8bc4 | 0200 | 5f87 | 0000 | 3287 | 0000 | 0008 | 0012 | 99f8 | 0012 | 9a7c | 0001 | 006a | 0000 | 0000 | 2c78 | 0024 | 0002 | 438a | 2520 | 3310 | 4300 | 0000 |
| 2413460 | 0000 | 52b7 | 0011 | ffe4 | 0010 | 3cf4 | 242c | 0000 | 0012 | c004 | 000f | be10 | 0200 | 5f8f | 0000 | 3287 | 0000 | 0008 | 0012 | 9af8 | 0012 | 9b1c | 0001 | 006a |
| 2413540 | 0000 | 0000 | 000f | c188 | 0100 | 5f97 | 0000 | 3287 | 0000 | 0004 | 0011 | 468c | 0011 | 468c | 0001 | 0069 | 0000 | 0000 | 000f | c52c | 0300 | 5f9f | 0000 | 3287 |
| 2413620 | 0000 | 000c | 0012 | 8c3c | 0012 | 8c3c | 0001 | 006b | 0000 | 0000 | 0012 | 7075 | 7464 | 625f | 6172 | 6368 | 6974 | 6563 | 7475 | 7265 | 0000 | 0000 | 0011 | 508c |
| 2413700 | 0100 | 5cbf | 0000 | 3287 | 0000 | 0004 | 0012 | 0234 | 0012 | 0234 | 0001 | 0067 | 0000 | 0000 | 2c78 | 0024 | 0002 | 438a | 2520 | 3310 | 4300 | 0000 | 0000 | 5237 |
| 2413760 | 0011 | ffe4 | 0010 | 3cf4 | 242c | 0000 | 0012 | 00a0 | 000f | c5c0 | 0100 | 5fa7 | 0000 | 3287 | 0000 | 0004 | 0011 | 4590 | 0011 | 4590 | 0001 | 0069 | 0000 | 0000 |
| 2414040 | 000f | c5e0 | 0100 | 5faf | 0000 | 3287 | 0000 | 0004 | 0012 | 8de4 | 0012 | 8de4 | 0001 | 006b | 0000 | 0000 | 000f | c6dc | 0100 | 5fb7 | 0000 | 3287 | 0000 | 0004 |
| 2414120 | 0012 | 8e60 | 0012 | 8e60 | 0001 | 006b | 0000 | 0000 | 0010 | 7075 | 7464 | 625f | 7374 | 6174 | 6562 | 6c6f | 636b | 0000 | 000f | c844 | 0100 | 5fc7 | 0000 | 3287 |
| 2414200 | 0000 | 0004 | 000b | 33d4 | 000b | 38d4 | 0001 | 0069 | 0000 | 0000 | 000d | 2170 | 0100 | 5fcf | 0000 | 3287 | 0000 | 0004 | 000b | 3868 | 000b | 3868 | 0001 | 0069 |
| 2414260 | 0000 | 0000 | 000f | 7075 | 7464 | 625f | 7375 | 6363 | 6573 | 736f | 7200 | 0000 | 0011 | 656e | 636f | 6465 | 5f55 | 7870 | 7265 | 7373 | 696f | 6e00 | 000f | c388 |
| 2414340 | 0200 | 5fdf | 0000 | 3287 | 0000 | 0008 | 0012 | c814 | 0012 | c814 | 0001 | 006b | 0000 | 0000 | 000f | cad8 | 0200 | 5fe7 | 0000 | 3287 | 0000 | 0008 | 000b | 3940 |
| 2414420 | 000b | 3940 | 0001 | 0069 | 0000 | 0000 | 000f | cce4 | 0200 | 5fef | 0000 | 3287 | 0000 | 0008 | 0012 | 0a64 | 0011 | d1b8 | 0001 | 0067 | 0000 | 0000 | 0012 | 018c |
| 2414500 | 0400 | 5fe7 | 0000 | 3287 | 0000 | 0010 | 0011 | 7390 | 0011 | 7390 | 0001 | 0069 | 0000 | 0000 | 2cac | 0000 | 0002 | 438a | 2ca0 | 0000 | 0000 | 0000 | 0000 | 0001 |
| 2414560 | 0011 | c4e0 | 0011 | c4e0 | 0002 | 438a | 0011 | df44 | 2c78 | 0024 | 0002 | 438a | 2520 | 3310 | 4300 | 0000 | 0000 | 5fff | 0011 | ffe4 | 0010 | 3cf4 | 242c | 0000 |
| 2414640 | 0012 | 005c | 2cac | 0000 | 0002 | 438a | 2ca0 | 0000 | 0000 | 0000 | 0000 | 0001 | 0011 | c669 | 0011 | c668 | 0002 | 438a | 0011 | bf1c | 0011 | 6375 | 7272 | 656e |
| 2414720 | 745f | 7061 | 7265 | 6e74 | 5f69 | 6400 | 2c78 | 0020 | 0002 | 438a | 45b8 | 46ec | 32b8 | 247c | 0012 | 029c | 0018 | 3d6c | 2410 | 0000 | 0012 | 02bc | 000c | aeec |
| 2415000 | 0100 | 600f | 0000 | 3287 | 0000 | 0004 | 0012 | 1318 | 0012 | 1318 | 0001 | 0067 | 0000 | 0000 | 0011 | 68e4 | 0300 | 5e87 | 0000 | 3287 | 0000 | 000c | 0012 | 02e0 |
| 2415060 | 0012 | 02e0 | 0001 | 0067 | 0000 | 0000 | 27f0 | 0012 | 0011 | c7a0 | 4e1c | 0000 | 0000 | 0007 | 2edc | 0000 | 2cac | 0000 | 0002 | 438a | 2ca0 | 0000 | 0000 | 0000 |
| 2415140 | 0000 | 0001 | 0012 | 02cc | 0011 | c7a0 | 0011 | c7aa | 0012 | 0304 | 0012 | 02d8 | 000e | 7075 | 7464 | 625f | 7661 | 7269 | 6162 | 6c65 | 0000 | 0000 | 000f | cde4 |
| 2415220 | 0400 | 6017 | 0000 | 3287 | 0000 | 0010 | 0012 | 7908 | 0012 | 7908 | 0001 | 0069 | 0000 | 0000 | 000e | 6c65 | 6761 | 6c5f | 7661 | 7269 | 6162 | 6c65 | 0000 | 0000 |
| 2415300 | 0011 | 6173 | 7369 | 676e | 5f65 | 7870 | 7265 | 7373 | 696f | 6e00 | 000f | cdb4 | 0100 | 601f | 0000 | 3287 | 0000 | 0004 | 0012 | 0ef0 | 0012 | 0f08 | 0001 | 0067 |
| 2415360 | 0000 | 0000 | 0011 | ff50 | 0200 | 6027 | 0000 | 3287 | 0000 | 0008 | 0011 | ca20 | 0011 | cb08 | 0001 | 0067 | 0000 | 0000 | 000f | d160 | 0100 | 602f | 0000 | 3287 |
| 2415440 | 0000 | 0004 | 0012 | 1178 | 0012 | 1178 | 0001 | 0067 | 0000 | 0000 | 0010 | 7661 | 7269 | 6162 | 6c65 | 5f6e | 616d | 655f | 6964 | 0000 | 000e | 7075 | 7464 | 625f |
| 2415520 | 6f70 | 6572 | 6174 | 6f72 | 0000 | 0000 | 000c | af18 | 0200 | 6037 | 0000 | 3287 | 0000 | 0008 | 0011 | d9c8 | 0011 | d9f8 | 0001 | 0067 | 0000 | 0000 | 0010 | 1980 |
| 2415600 | 0400 | 603f | 0000 | 3287 | 0000 | 0010 | 0011 | cb80 | 0011 | cb80 | 0001 | 0067 | 0000 | 0000 | 0019 | 656e | 636f | 6465 | 5f66 | 756e | 6374 | 696f | 6e5f | 6172 |
| 2415660 | 6775 | 6d65 | 6e74 | 7300 | 0010 | 18dc | 0200 | 6047 | 0000 | 3287 | 0000 | 0008 | 000a | 18f0 | 000a | 18f0 | 0000 | 0000 | 0000 | 0000 | 000f | 6f70 | 6572 | 6174 |
| 2415740 | 6f72 | 5f6f | 7063 | 6f64 | 6500 | 0000 | 0011 | 7075 | 7464 | 625f | 6f70 | 6572 | 6174 | 6f72 | 5f69 | 6f00 | 000f | 6f70 | 6572 | 6174 | 6f72 | 5f69 | 6e70 | 7574 |
| 2416020 | 7300 | 0000 | 0010 | 6f70 | 6572 | 6174 | 6f72 | 5f6f | 7574 | 7075 | 7473 | 0000 | 0010 | 18fc | 0100 | 6057 | 0000 | 3287 | 0000 | 0004 | 0011 | cf1c | 0011 | cf1c |
| 2416100 | 0001 | 0067 | 0000 | 0000 | 0010 | 1960 | 0200 | 605f | 0000 | 3287 | 0000 | 0008 | 0012 | 3b34 | 0012 | 3b34 | 0001 | 0068 | 0000 | 0000 | 0008 | e6ac | 0200 | 6067 |
| 2416160 | 0000 | 3287 | 0000 | 0008 | 0012 | 3af0 | 0012 | 3af0 | 0001 | 0068 | 0000 | 0000 | 0010 | 1b48 | 0400 | 606f | 0000 | 3287 | 0000 | 0010 | 0011 | cc34 | 0011 | cc34 |
| 2416240 | 0001 | 0067 | 0000 | 0000 | 0011 | 633c | 0200 | 607f | 0000 | 3287 | 0000 | 0008 | 0012 | 3c40 | 0012 | 3c40 | 0001 | 0068 | 0000 | 0000 | ffff | ffff | 0200 | 6087 |
| 2416320 | 0000 | 3287 | 0000 | 0008 | 0012 | 3c84 | 0012 | 3c84 | 0001 | 0068 | 0000 | 0000 | 0012 | 040c | 0100 | 603f | 0000 | 3287 | 0000 | 0004 | 0011 | 3ffc | 0011 | 3ffc |
| 2416400 | 0001 | 0069 | 0000 | 0000 | 0012 | 0518 | 0500 | 606f | 0000 | 3287 | 0000 | 0014 | 0011 | 5f38 | 0011 | cc9c | 0001 | 0067 | 0000 | 0000 | 000f | 696f | 6e6f | 6465 |
| 2416460 | 5f70 | 6172 | 656e | 746f | 7000 | 0000 | 0011 | 696f | 6e6f | 6465 | 5f70 | 6172 | 656e | 7470 | 726f | 6300 | 0015 | 7075 | 7464 | 625f | 6f70 | 6572 | 6174 | 6f72 |
| 2416540 | 5f69 | 6f5f | 6175 | 7800 | 0008 | e6ec | 0100 | 608f | 0000 | 3287 | 0000 | 0004 | 0012 | 0988 | 0012 | 0988 | 0001 | 0067 | 0000 | 0000 | 0008 | bc6c | 0200 | 6097 |
| 2416620 | 0000 | 3287 | 0000 | 0008 | 0012 | 3f38 | 0012 | 3f38 | 0001 | 0068 | 0000 | 0000 | 0010 | 1d70 | 0200 | 609f | 0000 | 3287 | 0000 | 0008 | 0012 | 40b8 | 0012 | 40b8 |
| 2416700 | 0001 | 0068 | 0000 | 0000 | 0010 | 14f0 | 0200 | 60a7 | 0000 | 3287 | 0000 | 0008 | 0012 | 40fc | 0012 | 40fc | 0001 | 0068 | 0000 | 0000 | 0008 | bcac | 0200 | 60af |
| 2416760 | 0000 | 3287 | 0000 | 0008 | 0012 | 3ef4 | 0012 | 3ef4 | 0001 | 0068 | 0000 | 0000 | 0008 | bccc | 0300 | 60b7 | 0000 | 3287 | 0000 | 000c | 0012 | 0744 | 0012 | 0744 |
| 2417040 | 0001 | 0067 | 0000 | 0000 | 0008 | bcec | 0100 | 60bf | 0000 | 3287 | 0000 | 0004 | 0011 | 3e80 | 0011 | 3e80 | 0001 | 0069 | 0000 | 0000 | 0010 | 6e65 | 775f | 696e |
| 2417120 | 7465 | 726d | 6564 | 6961 | 7465 | 0000 | 0012 | 696f | 6e6f | 6465 | 5f76 | 6172 | 6961 | 626c | 655f | 6964 | 0000 | 0000 | 0010 | 3f20 | 0200 | 60c7 | 0000 | 3287 |
| 2417200 | 0000 | 0008 | 0012 | 8f14 | 0012 | 8f14 | 0001 | 006b | 0000 | 0000 | 0010 | 3fb8 | 0200 | 60cf | 0000 | 3287 | 0000 | 0008 | 0012 | 3f7c | 0012 | 3f7c | 0001 | 0068 |
| 2417260 | 0000 | 0000 | 2cac | 0000 | 0002 | 438a | 2ca0 | 0000 | 0000 | 0004 | 0000 | 0002 | 0011 | cd60 | 0011 | ce88 | 0002 | 438a | 0010 | 18d4 | 0012 | 0a14 | 0010 | 4080 |
| 2417340 | 0200 | 60d7 | 0000 | 3287 | 0000 | 0008 | 0012 | 4024 | 0012 | 4024 | 0001 | 0068 | 0000 | 0000 | 000f | 636f | 6e73 | 7461 | 6e74 | 5f61 | 6e64 | 5f69 | 6400 | 0000 |
| 2417420 | 000e | 636f | 6e73 | 7461 | 6e74 | 5f76 | 616c | 7565 | 0000 | 0000 | 0010 | 696f | 6e6f | 6465 | 5f61 | 7474 | 7269 | 6275 | 7465 | 0000 | 0011 | 3400 | 0100 | 60df |
| 2417500 | 0000 | 3287 | 0000 | 0004 | 0012 | 4f74 | 0012 | 4f74 | 0001 | 0068 | 0000 | 0000 | 0010 | 41b4 | 0100 | 60e7 | 0000 | 3287 | 0000 | 0004 | 0012 | 4fc4 | 0012 | 4fc4 |
| 2417560 | 0001 | 0068 | 0000 | 0000 | ffff | ffff | 0200 | 60ef | 0000 | 3287 | 0000 | 0008 | 0012 | 0e58 | 0012 | 0e58 | 0001 | 0067 | 0000 | 0000 | 000c | 181c | 0200 | 60f7 |
| 2417640 | 0000 | 3287 | 0000 | 0008 | 0012 | 4a48 | 0012 | 4a48 | 0001 | 0068 | 0000 | 0000 | 0008 | bd4c | 0200 | 60ff | 0000 | 3287 | 0000 | 0008 | 0012 | 4a04 | 0012 | 4a04 |

```
2417720  0001 0068 0000 0000 0008 bd6c 0200 6107 0000 3287 0000 0008 000a 18f0 000a 18f0 0000 0000 0000 0000 0010 ab5c 0200 610f
2420000  0000 3287 0000 0008 0012 4068 0012 4068 0001 0068 0000 0000 0010 aacc 0100 6117 0000 3287 0000 0004 0012 4f24 0012 4f24
2420060  0001 0068 0000 0000 0010 aafc 0100 611f 0000 3287 000c 0004 0012 735c 0012 735c 0001 0069 0000 0000 000f 6f70 6572 6174
2420140  6f72 5f6e 756d 6265 7200 0000 0015 6375 7272 656e 745f 7374 6174 6562 6c6f 636b 5f69 6400 000f 6f70 6572 6174 6f72 5f70
2420220  6172 656e 7400 0000 0010 abbc 0200 6127 0000 3287 0000 0008 0011 ea30 0011 ea30 0001 0068 0000 0000 0010 ac1c 0100 612f
2420300  0000 3287 0000 0004 0012 133c 0012 133c 0001 0067 0000 0000 0010 ac7c 0200 6137 0000 3287 0000 0008 0012 3d50 0012 3d50
2420360  0001 0068 0000 0000 2c78 0024 0002 438a 45b8 332c 4300 0000 0000 5ec7 0011 be4c 0014 3d30 2420 0000 0012 09bc ffff ffff
2420440  0200 613f 0000 3287 0000 0008 0011 ee18 0011 ee18 0001 0068 0000 0000 0016 656e 636f 6465 5f65 7870 7265 7373 696f 6e5f
2420520  6c69 7374 0000 0000 ffff ffff 0200 6147 0000 3287 0000 0008 0012 0a1c 0012 0a1c 0001 0067 0000 0000 27f0 0014 0012 0a40
2420600  4e1c 0000 0000 0007 54a8 2edc 2cac 0000 0002 438a 2ca0 0000 0000 0000 0000 0001 0012 0a08 0012 0a40 0012 0a4a 0012 0768
2420660  2954 0024 0002 438a 56f8 671c 692c 5758 6750 6a00 24d0 0000 0012 01bc 0014 2330 0012 09f8 27f0 0000 0011 d1b8 2ca0 0000
2420740  0000 000c 0000 0004 0011 d054 0011 d1b8 0002 438a c011 5908 ffff ffff 0200 614f 0000 3287 0000 0008 0011 d230 0011 d230
2421020  0001 0067 0000 0000 000f 7661 7269 6162 6c65 5f70 6172 656e 7400 0000 0010 842c 0200 615f 0000 3287 0000 0008 0012 429c
2421100  0012 429c 0001 0068 0000 0000 0010 848c 0200 6167 0000 3287 0000 0008 0012 4414 0012 4414 0001 0068 0000 0000 0010 a594
2421160  0200 616f 0000 3287 0000 0008 0012 43d0 0012 43d0 0001 0068 0000 0000 000e 6f70 6572 6174 6f72 5f63 6f75 6e74 0000 0000
2421240  0008 e8ac 0200 6177 0000 3287 0000 0008 000a 18f0 000a 18f0 0000 0000 0000 0000 0015 666f 726d 5f6f 7065 7261 746f 725f
2421320  6964 5f6c 6973 7400 0010 6272 616e 6368 5f6f 7065 7261 746f 7273 0000 001b 6f70 6572 6174 6f72 5f62 6c6f 636b 5f6f 7574
2421400  7075 745f 7061 6972 7300 0000 0008 e8ec 0300 6187 0000 3287 0000 000c 0012 0c90 0012 0c90 0001 0067 0000 0000 0010 a7d8
2421460  0200 618f 0000 3287 0000 0008 000a'18f0 000a 18f0 0000 0000 0000 0000 0010 a778 0200 6197 0000 3287 0000 0008 000a 18f0
2421540  000a 18f0 0000 0000 0000 0000 0010 a94c 0200 619f 0000 3287 0000 0008 000a 18f0 000a 18f0 0000 0000 0000 0000 0011 6f70
2421620  6572 6174 6f72 5f62 7261 6e63 6865 7300 0010 a92c 0100 61a7 0000 3287 0000 0004 0012 733c 0012 733c 0001 0069 0000 0000
2421700  0010 a880 0200 61af 0000 3287 0000 0008 000a 18f0 000a 18f0 0000 0000 0000 0000 0010 a90c 0200 61b7 0000 3287 0000 0008
2421760  000a 18f0 000a 18f0 0000 0000 0000 0000 2c78 0028 0002 438a 45b8 46ec 477c aa18 aa34 a3ec 32b8 247c 0012 029c 001c 38e8
2422040  3d6c 2330 0012 0cc8 0012 0b9c 0400 6187 0000 3287 0000 0010 0011 5660 0011 d67c 0001 0067 0000 0000 0011 48ac 0100 5c17
2422120  0000 3287 0000 0004 0011 55e4 0011 55e4 0001 0067 0000 0000 0008 beac 0100 61c7 0000 3287 0000 0004 000a 18f0 000a 18f0
2422200  0000 0000 0000 0000 0012 0cd8 0400 5c17 0000 3287 0000 0010 0011 d794 0011 d794 0001 0067 0000 0000 2c78 0014 0002 438a
2422260  5d10 0000 0200 523f 5f8c c5a8 2954 0000 0002 438a 2ca0 0000 0000 0000 0000 0001 0012 0d38 0012 0d38 0002 438a 0012 0d70
2422340  0012 0144 0012 0118 0300 5c17 0300 3287 0000 000c 0012 0df4 0012 0df4 0001 0067 0000 0000 ffff ffff 0200 61cf 0000 3287
2422420  0000 0008 0012 0f78 0011 ddc8 0001 0067 0000 0000 0008 c0ac 0400 32e7 0000 3287 0000 0010 000a 18f0 000a 18f0 0000 0000
2422500  0000 0000 ffff ffff 0100 61e7 0000 3287 0000 0004 0012 0e30 0012 0e30 0001 0067 0000 0000 2cac 0000 0002 438a 2ca0 0000
2422560  0000 0000 0000 0001 0011 d830 0011 d830 0002 438a 0012 0e18 0011 d83c 2c78 0012 0002 438a 4e1c 0000 0000 523f 228c 0000
2422640  2cac 0000 0002 438a 2ca0 0000 0000 0000 0000 0001 0012 0e1c 0012 0e1c 0002 438a 0012 0e54 0012 0e28 2c78 0018 0002 438a
2422720  45b8 39a4 0012 0e80 0010 2340 0012 0ad8 0008 becc 0200 61ef 0000 3287 0000 0008 0012 49c0 0012 49c0 0001 0068 0000 0000
2423000  0015 636f 6e73 7461 6e74 5f76 616c 7565 5f61 6e64 5f69 6400 ffff ffff 0300 61f7 0000 3287 0000 000c 0012 0ec8 0012 0ec8
2423060  0001 0067 0000 0000 2c78 0028 0002 438a 45b8 46ec 35ec 39a4 0012 0e80 0014 37f0 3b4c 0000 0012 0838 0010 2340 0012 08d8
2423140  27f0 0018 0012 0f08 2520 320c 24d0 0000 0012 03fc 000c 2eb0 2954 001c 0002 438a 35c8 2520 4300 0000 0000 61ff 0008 c0fc
2423220  000c c5a8 0012 03ec 0400 6037 0000 3287 0000 0010 0011 da60 0011 da60 0001 0067 0000 0000 0012 0f24 0300 6037 0000 3287
2423300  0000 000c 0011 dafc 0011 dafc 0001 0067 0000 0000 000f 7072 6f63 626f 6479 5f70 6172 656e 7400 0000 27f0 001c 0011 cf9c
2423360  45b8 46ec 3b4c 0000 0012 0fa4 0014 2330 0012 0fc4 000f 87c4 0100 5ed7 0000 3287 0000 0004 0012 34a4 0012 34a4 0001 0068
2423440  0000 0000 ffff ffff 0200 6207 0000 3287 0000 0008 0012 3574 0012 3574 0001 0068 0000 0000 ffff ffff 0200 620f 0000 3287
2423520  0000 0008 0012 34cc 0012 34cc 0001 0068 0000 0000 28c4 001c 0011 cfc8 45b8 46ec 3b4c 0000 0012 1020 0014 2330 0012 0978
2423600  000c 6504 0100 5ebf 0000 3287 0000 0004 0012 3ac8 0012 3ac8 0001 0068 0000 0000 28c4 001c 0011 ddc8 45b8 46ec 3b4c 0000
2423660  0012 1020 0014 2330 0012 0b0c 000f 6578 6973 7473 5f70 726f 6362 6f64 7900 0000 ffff ffff 0200 6217 0000 3287 0000 0008
2423740  0011 de2c 0011 de2c 0001 0067 0000 0000 ffff ffff 0100 621f 0000 3287 0000 0004 0012 7654 0012 7654 0001 0069 0000 0000
2424020  0012 1060 0300 6217 0000 3287 0000 000c 0011 de90 0011 de90 0001 0067 0000 0000 ffff ffff 0200 6227 0000 3287 0000 0008
2424100  0012 3510 0012 3510 0001 0068 0000 0000 0008 beec 0200 622f 0000 3287 0000 0008 000d f9f8 000d f9f8 0001 0067 0000 0000
2424160  0012 10e0 0300 622f 0000 3287 0000 000c 0011 9714 0011 9714 0001 0067 0000 0000 001e 7e6e 2a2a 2a20 5761 726e 696e 673a
2424240  2022 7e73 2220 6367 6e6f 7265 642e 7e6e 0000 0000 2c78 001c 0002 438a 4550 6b48 5370 41d4 0000 623f 239c 0000 0008 c0fc
2424320  0014 7e6e 2a2a 2a20 5761 726e 696e 673a 207e 732e 7e6e 0000 2c78 001c 0002 438a 4550 6b48 5370 41d4 0000 6247 239c 0000
2424400  0008 c0fc 000e 656e 7469 7479 5f6e 616d 655f 6964 0000 0000 0008 ea4c 0100 624f 0000 3287 0000 0004 0011 4dc0 0011 4dc0
2424460  0001 0067 0000 0000 0008 bf4c 0200 6257 0000 3287 0000 0008 0011'989c 0011 98cc 0001 0067 0000 0000 0008 bf8c 0200 625f
2424540  0000 3287 0000 0008 0012 9a98 0012 9a1c 0001 006a 0000 0000 ffff ffff 0200 6267 0000 3287 0000 0008 0012 35b8 0012 35b8
2424620  0001 0068 0000 0000 0014 6172 6368 6974 6563 7475 7265 5f6e 616d 655f 6964 0000 0008 bfcc 0200 626f 0000 3287 0000 0008
2424700  0011 994c 0011 997c 0001 0067 0000 000c 0011 6375 7272 656e 745f 656e 7469 7479 5f69 6400 0008 eaac 0100 6277 0000 3287
2424760  0000 0004 0012 1294 0012 1294 0001 0067 0000 0000 2c78 0024 0002 438a 45c4 3310 4300 0000 0000 52b7 0012 11f8 0014 37f0
```

```
2425040  3cf4 234c 0012 0fe4 0017 6375 7272 656e 745f 6172 6368 6974 6563 7475 7265 5f69 6400 0000 0008 c00c 0100 627f 0000 3287
2425120  0000 0004 0012 12f4 0012 12f4 0001 0067 0000 0000 2c78 0024 0002 438a 45c4 3310 4300 0000 0000 5237 0012 11f8 0014 37f0
2425200  3cf4 234c 0012 0fe4 2c78 0024 0002 438a 45c4 3310 4300 0000 0000 6287 0012 11f8 0014 37f0 3cf4 234c 0012 0fe4 2c78 0024
2425260  0002 438a 45c4 3310 4300 0000 0000 5ee7 0012 11f8 0014 37f0 3cf4 234c 0012 0fe4 0013 6375 7272 656e 745f 7072 6f63 626f
2425340  6479 5f69 6400 0000 0010 3e38 0100 628f 0000 3287 0000 0004 0012 1398 0012 1398 0001 0067 0000 0000 2c78 0024 0002 438a
2425420  45c4 3310 4300 0000 0000 5ed7 0012 11f8 0014 37f0 3cf4 234c 0012 0fe4 000f 6173 7369 676e 5f76 6172 6961 626c 6500 0000
2425500  0008 eacc 0200 6297 0000 3287 0000 0008 0012 13f0 0011 9b88 0001 0067 0000 0000 27f0 0000 0011 9b88 2ca0 0000 0000 0000
2425560  0000 0001 0011 9b14 0011 9b88 0002 438a 0012 1414 0011 9b20 0010 7072 6f63 626f 6479 5f6f 7574 7075 7473 0000 000e 7072
2425640  6f63 626f 6479 5f63 616c 6c73 0012 1418 0012 3498 0000 002c 0012 51e0 b27c b66c 0000 0b0e 7fff ffff 0011 e188 0200 0db5
2425720  0200 2f35 0000 62e7 0000 034b 0000 315f 0000 002c 0012 520c b27c b66c 0000 0b74 7fff ffff 0011 e1b4 0200 0db5 0200 224d
2426000  0000 62e7 0000 3287 0000 315f 0010 7668 646c 5f73 6f75 7263 655f 6c69 6e65 0000 0012 5188 0000 1f9c b27c b66c 0000 0b10
2426060  0000 0b73 000a d16d 0200 0db5 0200 270d 0000 62e7 0000 3287 0000 315f 0012 5188 0000 1f70 696e 7465 726d 6564 6961 7465
2426140  5f6e 756d 6265 7228 6964 2874 2d4e 2c20 5f4f 7049 6429 2c20 4e29 2e0a 696e 7465 726d 6564 6961 7465 5f70 6172 656e 7428
2426220  6964 2874 2d5f 4e2c 2050 6172 656e 7429 2c20 5061 7265 6e74 292e 0a0a 2525 2525 2525 2525 2525 2525 2525 2525 2525 2525
2426300  2525 2525 2525 2525 2525 2525 2525 2525 2525 2525 2525 2525 2525 2525 2525 2525 2525 2525 2525 2525 2525 2525 2525 2525
2426360  2525 2525 2525 2525 2525 0a25 2525 2520 536f 6165 2064 6561 6c61 7261 7469 6f6e 7320 666f 7220 636f 6e74 726f 6c20 7369
2426440  676e 616c 206f 7574 7075 7420 6f66 206f 7065 7261 746f 7273 0a0a 636f 6e74 726f 6c5f 6e75 6d62 6572 2869 6428 636f 6e2d
2426520  4e2c 205f 4f70 4964 292c 204e 292e 0a63 6f6e 7472 6f6c 5f70 6172 656e 7428 6964 2863 6f6e 2d5f 4e2c 2050 6172 656e 7429
2426600  2c20 5061 7265 6e74 292e 0a0a 2525 2525 2525 2525 2525 2525 2525 2525 2525 2525 2525 2525 2525 2525 2525 2525 2525 2525
2426660  2525 2525 2525 2525 2525 2525 2525 2525 2525 2525 2525 2525 2525 2525 2525 2525 2525 2525 2525 2525 2525 0a25 2050 7574
2426740  2066 6f6c 6c6f 7769 6e67 2069 6e20 6120 5469 6666 6572 656e 7420 6669 6c65 2028 6765 6e65 7269 635f 7574 696c 6974 6965
2427020  7332 2e70 6c20 6d61 7962 6529 203f 0a25 204f 6e20 7468 6520 6f74 6865 7220 6861 6e64 2049 2074 6869 6e6b 2069 7420 7368
2427100  6f75 6c64 2062 656c 6f6e 6720 6865 7265 2073 696e 6365 2069 7420 6465 7065 6e64 730a 2520 6f6e 2074 6865 2077 6179 2074
2427160  6869 6e67 7320 6172 6520 6465 636c 6172 6564 2069 6e20 7468 6520 6461 7461 2062 6173 652e 0a0a 6973 5f70 726f 6362 6f64
2427240  7928 6964 2870 215f 4d29 292e 0a69 735f 6f70 6572 6174 6f72 2869 6428 6f70 2d5f 4d2c 205f 5061 7265 6e74 5072 6f63 4964
2427320  2929 2e0a 6973 5f69 6f6e 6f64 6528 6964 2869 6f2d 5f4d 2c20 5f4f 7049 6429 292e 0a69 735f 7661 7269 6162 6c65 2869 6428
2427400  762d 5f4d 2c20 5f50 6172 656e 7450 726f 6349 6429 292e 0a69 735f 636f 6e73 7461 6e74 2869 6428 632d 5f4d 2c20 5f50 6172
2427460  656e 7450 726f 6349 6429 292e 0a69 735f 696e 7465 726d 6564 6961 7465 2869 6428 742d 5f4d 2c20 5f4f 7049 6429 292e 0a69
2427540  735f 636f 6e74 726f 6c28 6964 2863 6f6e 2d5f 4d2c 205f 4f70 4964 2929 2e0a 250a 250a 6964 5f74 7970 6528 7072 6f63 626f
2427620  6479 2c20 6964 2970 2d5f 4d29 292e 0a69 645f 7479 7065 286f 7065 7261 746f 722c 2069 6428 6f70 2d5f 4d2c 205f 5061 7265
2427700  6e74 5072 6f63 4964 2929 2e0a 6964 5f74 7970 6528 696f 6e6f 6465 2c20 6964 2869 6f2d 5f4d 2c20 5f4f 7049 6429 292e 0a69
2427760  645f 7479 7065 2876 6172 6961 626c 652c 2069 6428 762d 5f4d 2c20 5f50 6172 656e 7450 726f 6349 6429 292e 0a69 645f 7479
2430040  7065 2863 6f6e 7374 616e 742c 2069 6428 632d 5f4d 2c20 5f50 6172 656e 7450 726f 6349 6429 292e 0909 2520 696e 7465 726d
2430120  6564 6961 7465 206f 6e74 6572 6d65 6469 6174 652c 2069 6428 742d 5f4d 2c20 5f4f 7049 6429 292e 0a69 645f 7479 7065 2863
2430200  6f6e 7472 6f6c 2c20 6964 2863 6f6e 2d5f 4d2c 205f 4f70 4964 2929 2e0a 250a 2520 5f50 6172 656e 7450 726f 6349 6429 292e
2430260  0a25 206f 7065 7261 746f 7273 0a0a 6f70 6572 6174 6f72 5f6c 6974 6572 616c 2869 6428 6f70 2d5f 4d2c 205f 5061 7265 6e74
2430340  5072 6f63 4964 2929 2e0a 6f70 2d5f 4d2c 205f 5061 7265 6e74 5072 6f63 4964 2929 2e0a 0a25 2069 6e74 6572 6d65 6469 6174
2430420  652c 2069 6428 742d 5f4d 2c20 5f4f 7049 6429 292e 0a69 645f 7479 7065 2863 6f6e 7472 6f6c 2c20 6964 2863 6f6e 2d5f 4d2c
2430500  205f 4f70 4964 2929 2e0a 250a 2520 5f50 6172 656e 7450 726f 6349 6429 292e 0a25 206f 7065 7261 746f 7273 0a0a 6f70 6572
2430560  6174 6f72 5f6c 6974 6572 616c 2869 6428 6f70 2d5f 4d2c 205f 5061 7265 6e74 5072 6f63 4964 2929 2e0a 6f70 2d5f 4d2c 205f
```

```
2432160  5f2c 5f2c 5f2c 5f2c 5f2c 5f2c 5f2c 4c29 2c20 4c29 2e0a 0a70 726f 6362 6f64 795f 6e75 6d62 6572 2850 726f 6362 6f64 792c
2432240  204e 2920 3a2d 0a09 7072 6f63 626f 6479 5f69 6428 5072 6f63 626f 6479 2c20 6964 2870 2d4e 2929 2e0a 0a25 2525 2525 2525
2432320  2525 2525 2525 2525 2525 2525 2525 2525 2525 2525 2525 2525 2525 2525 2525 2525 2525 2525 2525 2525 2525 2525 2525 2525
2432400  2525 2525 2525 2525 2525 2525 2525 2525 2525 2525 2525 250a 3a2d 2064 796e 616d 6963 206f 7065 7261 746f 722f 3130 2e0a
2432460  250a 256f 7065 7261 746f 7228 4964 2c09 0909 2020 2025 2055 6e69 7175 6520 6964 0a25 0920 4f70 436f 6465 2c09 0920 2020
2432540  2520 6f70 6572 6174 6f72 0a25 0920 5479 7065 2c09 0909 2020 2025 2072 656d 6e61 6e74 7320 6672 6f6d 2049 5350 5320 2854
2432620  432c 204f 432c 534d 2c55 5329 0a25 0920 4361 6c6c 2c09 0909 2020 2025 206e 616d 6520 6f66 2070 726f 6365 6475 7265 206f
2432700  7220 626f 6479 2077 6520 6361 6c6c 2c0a 2509 0909 0920 2020 2520 7265 7374 6172 742c 2072 6573 756d 652c 206f 7220 6c65
2432760  6176 650a 2509 0909 0920 2020 2520 286c 6f74 2063 7572 7265 6e74 6c79 2075 7365 6429 0a25 0920 496e 7075 7473 2c09 0920
2433040  2020 2520 6c69 7374 206f 6620 696e 7075 7473 2074 6f20 7468 6520 6f70 6572 6174 6f72 0a25 0920 4f75 7470 7574 732c 0909
2433120  2020 2025 206c 6973 7420 6f66 206f 7574 7075 7473 2074 6f20 7468 6520 6f70 6572 6174 6f72 0a25 0920 4174 7472 6962 7574
2433200  6573 2c09 0920 2020 2520 6c69 7374 206f 6620 6174 7472 6962 7574 6573 0a25 0920 5061 7265 6e74 2c09 0920 2020 2520 6964
2433260  206f 6620 7061 7265 6e74 2062 6f64 7920 696e 2077 6869 6368 2074 6865 0a25 0909 0909 2020 2025 206f 7065 7261 746f 7220
2433340  6973 2064 6563 6c61 7265 640a 2509 2042 6974 7769 6474 6809 0920 2020 2520 6f70 6572 6174 6f72 2062 6974 2077 6964 7468
2433420  0a25 2009 2053 6f75 7263 655f 6c69 6e65 5f6e 756d 6265 7209 2020 2025 2073 6f75 7263 6520 6c69 6e65 206e 756d 6265 7220
2433500  2869 6620 6176 6169 6c61 626c 6529 0a25 2020 2020 2020 2020 2029 2e0a 250a 2520 4163 6365 7373 2046 756e 6374 696f 6e73
2433560  2066 6f72 206f 7065 7261 746f 7220 6669 656c 6473 2e0a 250a 6f70 6572 6174 6f72 286f 7065 7261 746f 7228 5f2c 5f2c 5f2c
2433640  5f2c 5f2c 5f2c 5f2c 5f2c 5f2c 5f29 292e 0a0a 6f70 6572 6174 6f72 5f69 6428 6f70 6572 6174 6f72 2869 6428 6f70 2d4e 2c50
2433720  6172 292c 5f2c 5f2c 5f2c 5f2c 5f2c 5f2c 5061 722c 5f2c 5f29 2c20 6964 286f 702d 4e2c 5061 7229 292e 0a6f 7065 7261 746f
2434000  725f 6f70 636f 6465 286f 7065 7261 746f 7228 5f2c 4f70 636f 6465 2c5f 2c5f 2c5f 2c5f 2c5f 2c5f 2c5f 2c5f 292c 204f 7063
2434060  6f64 6529 2e0a 6f70 6572 6174 6f72 5f74 7970 6528 6f70 6572 6174 6f72 285f 2c5f 2c54 7970 652c 5f2c 5f2c 5f2c 5f2c 5f2c
2434140  5f2c 5f29 2c20 5479 7065 292e 0a6f 7065 7261 746f 725f 6361 6c6c 286f 7065 7261 746f 7228 5f2c 5f2c 5f2c 4361 6c6c 2c5f
2434220  2c5f 2c5f 2c5f 2c5f 2c5f 292c 2043 616c 6c29 2e0a 6f70 6572 6174 6f72 5f69 6e70 7574 7328 6f70 6572 6174 6f72 285f 2c5f
2434300  2c5f 2c5f 2c49 6e70 7574 732c 5f2c 5f2c 5f2c 5f2c 5f29 2c20 496e 7075 7473 292e 0a6f 7065 7261 746f 725f 6f75 7470 7574
2434360  7328 6f70 6572 6174 6f72 285f 2c5f 2c5f 2c5f 2c5f 2c4f 7574 7075 7473 2c5f 2c5f 2c5f 2c5f 292c 204f 7574 7075 7473 292e
2434440  0a6f 7065 7261 746f 725f 6174 7472 6962 7574 6573 286f 7065 7261 746f 7228 5f2c 5f2c 5f2c 5f2c 5f2c 5f2c 4174 7472 6962
2434520  7574 6573 2c5f 2c5f 2c5f 292c 2041 7474 7269 6275 7465 7329 2e0a 6f70 6572 6174 6f72 5f70 6172 656e 7428 6f70 6572 6174
2434600  6f72 2869 6423 5f2c 5061 7265 6e74 292c 5f2c 5f2c 5f2c 5f2c 5f2c 5f2c 5061 7265 6e74 2c5f 2c5f 292c 2050 6172 656e 7429
2434660  2e0a 6f70 6572 6174 6f72 5f62 6974 7769 5474 6828 6f70 6572 6174 6f72 285f 2c5f 2c5f 2c5f 2c5f 2c5f 2c5f 2c5f 2c42 6974
2434740  7769 6474 682c 5f29 2c20 4269 7477 6964 7468 292e 0a6f 7065 7261 746f 725f 736f 7572 6365 5f6c 696e 655f 6e75 6d62 6572
2435020  286f 7065 7261 746f 7228 5f2c 5f2c 5f2c 5f2c 5f2c 5f2c 5f2c 5f2c 5f2c 4c29 2c20 4c29 2e0a 0a6f 7065 7261 746f 725f 6e75
2435100  6d62 6572 284f 7065 7261 746f 722c 204e 2920 3a2d 0a09 6f70 6572 6174 6f72 5f69 6428 4f70 6572 6174 6f72 2c20 6964 286f
2435160  702d 4e2c 5f29 292e 0a0a 250a 2525 2525 2525 2525 2525 2525 2525 2525 2525 2525 2525 2525 2525 2525 2525 2525 2525 2525
2435240  2525 2525 2525 2525 2525 2525 2525 2525 2525 2525 2525 2525 2525 2525 2525 2525 2525 2525 2525 2525 2525 0a3a 2d20 6479
2435320  6e61 6d69 6320 696f 6e6f 6465 2f31 302e 0a25 0a25 696f 6e6f 6465 2849 642c 0909 0920 2020 2520 556e 6971 7565 6c79 2069
2435400  6465 6e74 6966 6961 626c 6520 6964 0a25 0954 7970 652c 0909 0920 2020 2520 696e 7075 7420 2870 726f 6362 6f64 7920 696e
2435460  7075 7429 207c 0a25 0909 0909 2020 2025 206f 7574 7075 7420 2870 726f 6362 6f64 7920 6f75 7470 7574 290a 2509 5661 7269
2435540  6162 6c65 5f69 642c 0909 2020 2025 2069 6e69 7469 616c 6c79 2066 726f 6d20 7668 646c 2028 6964 2869 6f2c 6f70 2929 0a25
2435620  2020 2020 2020 2020 2020 2020 2020 2020 2020 2020 2020 2020 2020 2020 2020 2020 2020 2520 6f72 2028 6964 2876 6172 2c70
2435700  7229 290a 2509 4269 7473 2c09 0909 2020 2025 206e 756d 6265 7220 6f66 2062 6974 730a 2509 4e61 6d65 2c09 0909 2020 2025
2435760  206e 616d 6520 6672 6f6d 2076 6964 6c20 636f 6d70 696c 6572 0a25 0956 616c 7565 2c09 0909 2020 2025 2076 616c 7565 2069
2436040  6620 636f 6e73 7461 6e74 0a25 0950 6172 656e 744f 702c 0909 2020 2025 2070 6172 656e 7420 6f70 6572 6174 6f72 2069 640a
2436120  2509 5061 7265 6e74 5072 6f63 2c09 0920 2020 2520 7061 7265 6e74 2070 726f 6362 6f64 7920 6964 0a25 0941 7474 7269 6275
2436200  7465 7309 0920 2020 2520 6c69 7374 203a 2065 672e 2066 6f72 6d61 6c20 7c20 636f 6e73 7461 6e74 0a25 0953 6f75 7263 655f
2436260  6c69 6e65 5f6e 756d 6265 7209 2020 2025 2073 6f75 7263 6520 6c69 6e65 206e 756d 6265 7220 2869 6620 6176 6169 6c61 626c
2436340  6529 0a25 2020 2020 292e 0a25 0a25 2041 6363 6573 7320 4675 6e63 7469 6f6e 7320 666f 7220 696f 6e6f 6465 2066 6965 6c64
2436420  732e 0a25 0a69 6f6e 6f64 6528 696f 6e6f 6465 285f 2c5f 2c5f 2c5f 2c5f 2c5f 2c5f 2c5f 2c5f 2c5f 2929 2e0a 0a69 6f6e 6f64
2436500  655f 6964 2869 6f6e 6f64 6528 6964 2869 6f2d 4e2c 4f70 292c 5f2c 5f2c 5f2c 5f2c 5f2c 4f70 2c5f 2c5f 2c5f 292c 2069 6428
2436560  696f 2d4e 2c4f 7029 292e 0a69 6f6e 6f64 655f 7479 7065 2869 6f6e 6f64 6528 5f2c 5479 7065 2c5f 2c5f 2c5f 2c5f 2c5f 2c5f
2436640  2c5f 2c5f 292c 2054 7970 6529 2e0a 696f 6e6f 6465 5f76 6172 6961 626c 655f 6964 2869 6f6e 6f64 6528 5f2c 5f2c 5661 7269
2436720  6162 6c65 5f69 642c 5f2c 5f2c 5f2c 5f2c 5f2c 5f2c 5f29 2c20 5661 7269 6162 6c65 5f69 6429 2e0a 696f 6e6f 6465 5f62 6974
2437000  7328 696f 6e6f 6465 285f 2c5f 2c5f 2c42 6974 732c 5f2c 5f2c 5f2c 5f2c 5f2c 5f29 2c20 4269 7473 292e 0a69 6f6e 6f64 655f
2437060  6e61 6d65 2869 6f6e 6f64 6528 5f2c 5f2c 5f2c 5f2c 4e61 6d65 2c5f 2c5f 2c5f 2c5f 2c5f 292c 204e 616d 6529 2e0a 696f 6e6f
2437140  6465 5f76 616c 7565 2869 6f6e 6f64 6528 5f2c 5f2c 5f2c 5f2c 5f2c 5661 6c75 652c 5f2c 5f2c 5f2c 5f29 2c20 5661 6c75 6529
2437220  2e0a 696f 6e6f 6465 5f70 6172 656e 746f 7028 696f 6e6f 6465 2869 6428 5f2c 4f70 292c 5f2c 5f2c 5f2c 5f2c 5f2c 4f70 2c5f
```

| | | | | | | | | | | | | | | | | | | | | | | | | |
|---|---|---|---|---|---|---|---|---|---|---|---|---|---|---|---|---|---|---|---|---|---|---|---|---|
| 2437300 | 2c5f | 2c5f | 292c | 204f | 7029 | 2e0a | 696f | 6e6f | 6465 | 5f70 | 6172 | 656e | 7470 | 726f | 6328 | 696f | 6e6f | 6465 | 285f | 2c5f | 2c5f | 2c5f | 2c5f | 2c5f |
| 2437360 | 2c5f | 2c50 | 726f | 632c | 5f2c | 5f29 | 2c20 | 5072 | 6f63 | 292e | 0a69 | 6f6e | 6f64 | 655f | 6174 | 7472 | 6962 | 7574 | 6573 | 2869 | 6f6e | 6f64 | 6528 | 5f2c |
| 2437440 | 5f2c | 5f2c | 5f2c | 5f2c | 5f2c | 5f2c | 5f2c | 4174 | 7472 | 6962 | 7574 | 6573 | 2c5f | 292c | 2041 | 7474 | 7269 | 6275 | 7465 | 7329 | 2e0a | 696f | 6e6f | 6465 |
| 2437520 | 5f73 | 6f75 | 7263 | 655f | 6c69 | 6e65 | 5f6e | 756d | 6265 | 7228 | 696f | 6e6f | 6465 | 285f | 2c5f | 2c5f | 2c5f | 2c5f | 2c5f | 2c5f | 2c5f | 2c5f | 2c4c | 292c |
| 2437600 | 204c | 292e | 0a0a | 696f | 6e6f | 6465 | 5f6e | 756d | 6265 | 7228 | 494f | 6e6f | 6465 | 2c20 | 4e29 | 203a | 2d0a | 0969 | 6f6e | 6f64 | 655f | 6964 | 2849 | 4f6e |
| 2437660 | 6f64 | 652c | 2069 | 6428 | 696f | 2d4e | 2c5f | 2929 | 2e0a | 250a | 2525 | 2525 | 2525 | 2525 | 2525 | 2525 | 2525 | 2525 | 2525 | 2525 | 2525 | 2525 | 2525 | 2525 |
| 2437740 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 2440020 | 2525 | 0a3a | 2d20 | 6479 | 6e61 | 6d69 | 6320 | 7661 | 7269 | 6162 | 6c65 | 2f36 | 2e0a | 250a | 2576 | 6172 | 6961 | 626c | 6528 | 4964 | 2c09 | 0909 | 2020 | 2025 |
| 2440100 | 2055 | 6e69 | 7175 | 656c | 7920 | 6964 | 656e | 7469 | 6669 | 6162 | 6c65 | 2069 | 640a | 2509 | 5479 | 7065 | 2c09 | 0909 | 2020 | 2025 | 2065 | 6720 | 696e | 7465 |
| 2440160 | 6765 | 722c | 2062 | 6974 | 5f76 | 6563 | 746f | 7220 | 6574 | 632e | 0a25 | 0944 | 6563 | 6c61 | 7261 | 7469 | 6f6e | 5f74 | 7970 | 652c | 0920 | 2020 | 2520 | 666f |
| 2440240 | 726d | 616c | 2c20 | 6c6f | 6361 | 6c0a | 2520 | 2020 | 2020 | 2020 | 5061 | 7265 | 6e74 | 2c09 | 0909 | 2020 | 2025 | 2069 | 6420 | 6f66 | 2070 | 726f | 6362 | 6f64 |
| 2440320 | 7920 | 6465 | 636c | 6172 | 6564 | 2069 | 6e0a | 2509 | 4e61 | 6d65 | 0909 | 0920 | 2020 | 2520 | 6e61 | 6d65 | 2066 | 726f | 6d20 | 7668 | 646c | 2063 | 6f6d | 7069 |
| 2440400 | 6c65 | 720a | 2509 | 536f | 7572 | 6365 | 5f6c | 696e | 655f | 6e75 | 6d62 | 6572 | 0920 | 2020 | 2520 | 736f | 7572 | 6365 | 206c | 696e | 6520 | 6e75 | 6d62 | 6572 |
| 2440460 | 2028 | 6966 | 2061 | 7661 | 696c | 6162 | 6c65 | 290a | 2509 | 292e | 0a25 | 0a25 | 2041 | 6363 | 6573 | 7320 | 4675 | 6e63 | 7469 | 6f6e | 7320 | 666f | 7220 | 7661 |
| 2440540 | 7269 | 6162 | 6c65 | 2066 | 6965 | 6c64 | 730a | 250a | 7661 | 7269 | 6162 | 6c65 | 2876 | 6172 | 6961 | 626c | 6528 | 5f2c | 5f2c | 5f2c | 5f2c | 5f2c | 5f29 | 292e |
| 2440620 | 0a0a | 7661 | 7269 | 6162 | 6c65 | 5f69 | 6428 | 7661 | 7269 | 6162 | 6c65 | 2869 | 6428 | 762d | 4e2c | 5061 | 7265 | 6e74 | 292c | 5f2c | 5f2c | 5061 | 7265 | 6e74 |
| 2440700 | 2c5f | 2c5f | 292c | 2069 | 6428 | 762d | 4e2c | 5061 | 7265 | 6e74 | 2929 | 2e0a | 7661 | 7269 | 6162 | 6c65 | 5f74 | 7970 | 6528 | 7661 | 7269 | 6162 | 6c65 | 285f |
| 2440760 | 2c54 | 7970 | 652c | 5f2c | 5f2c | 5f2c | 5f29 | 2c20 | 5479 | 7065 | 292e | 0a76 | 6172 | 6961 | 626c | 655f | 6465 | 636c | 6172 | 6174 | 696f | 6e5f | 7479 | 7065 |
| 2441040 | 2876 | 6172 | 6961 | 626c | 6528 | 5f2c | 5f2c | 4465 | 636c | 5f74 | 7970 | 652c | 5f2c | 5f2c | 5f29 | 2c20 | 4465 | 636c | 5f74 | 7970 | 6529 | 2e0a | 7661 | 7269 |
| 2441120 | 6162 | 6c65 | 5f70 | 6172 | 656e | 7428 | 7661 | 7269 | 6162 | 6c65 | 2869 | 6428 | 5f2c | 5061 | 7265 | 6e74 | 292c | 5f2c | 5f2c | 5061 | 7265 | 6e74 | 2c5f | 2c5f |
| 2441200 | 292c | 2050 | 6172 | 656e | 7429 | 2e0a | 7661 | 7269 | 6162 | 6c65 | 5f6e | 616d | 6528 | 7661 | 7269 | 6162 | 6c65 | 285f | 2c5f | 2c5f | 2c5f | 2c4e | 616d | 652c |
| 2441260 | 5f29 | 2c20 | 4e61 | 6d65 | 292e | 0a76 | 6172 | 6961 | 626c | 655f | 736f | 7572 | 6365 | 5f6c | 696e | 655f | 6e75 | 6d62 | 6572 | 2876 | 6172 | 6961 | 626c | 6528 |
| 2441340 | 5f2c | 5f2c | 5f2c | 5f2c | 5f2c | 4c29 | 2c20 | 4c29 | 2e0a | 0a76 | 6172 | 6961 | 626c | 655f | 6e75 | 6d62 | 6572 | 2856 | 6172 | 6961 | 626c | 652c | 204e | 2920 |
| 2441420 | 3a2d | 0a09 | 7661 | 7269 | 6162 | 6c65 | 5f69 | 6428 | 5661 | 7269 | 6162 | 6c65 | 2c20 | 6964 | 2876 | 2d4e | 2c5f | 2929 | 2e0a | 250a | 2525 | 2525 | 2525 | 2525 |
| 2441500 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 2441560 | 2525 | 2525 | 2525 | 2525 | 2525 | 2525 | 2525 | 2525 | 2525 | 2525 | 2525 | 0a3a | 2d20 | 6479 | 6e61 | 6d69 | 6320 | 7479 | 7065 | 2f39 | 2e0a | 250a | 2574 | 7970 |
| 2441640 | 6528 | 2020 | 204e | 616d | 652c | 0909 | 0920 | 2020 | 2520 | 6e61 | 6d65 | 206f | 6620 | 7468 | 6520 | 7479 | 7065 | 0a25 | 0941 | 7474 | 7269 | 6275 | 7465 | 2c09 |
| 2441720 | 0920 | 2020 | 2520 | 7363 | 616c | 6172 | 7c20 | 636f | 6d70 | 6f73 | 6974 | 6520 | 7c20 | 6163 | 6365 | 7373 | 207c | 2066 | 696c | 650a | 2509 | 0909 | 0920 | 2020 |
| 2442000 | 2520 | 4e6f | 7465 | 2061 | 6363 | 6573 | 7320 | 2620 | 6669 | 6c65 | 2074 | 7970 | 6573 | 206e | 6f74 | 2073 | 7570 | 706f | 7274 | 6564 | 0a25 | 0953 | 7562 | 5f61 |
| 2442060 | 7474 | 7269 | 6275 | 7465 | 2c09 | 0920 | 2020 | 2520 | 656e | 756d | 6572 | 6174 | 696f | 6e7c | 696e | 7465 | 6765 | 727c | 7068 | 7973 | 6963 | 616c | 7c66 | 6c6f |
| 2442140 | 6174 | 202d | 7363 | 616c | 6172 | 0a25 | 0909 | 0909 | 2020 | 2025 | 2061 | 7272 | 6179 | 7c72 | 6563 | 6f72 | 6420 | 666f | 7220 | 636f | 6d70 | 6f73 | 6974 | 6520 |
| 2442220 | 7479 | 7065 | 730a | 2509 | 0909 | 0920 | 2020 | 2520 | 4e6f | 7465 | 2070 | 6879 | 7369 | 6361 | 6c2c | 666c | 6f61 | 742c | 7265 | 636f | 7264 | 206e | 6f74 | 2073 |
| 2442300 | 7570 | 706f | 7274 | 6564 | 0a25 | 094c | 6f77 | 2c09 | 0909 | 2020 | 2025 | 206c | 6f77 | 2076 | 616c | 7565 | 2066 | 6f72 | 2073 | 6361 | 6c61 | 7220 | 7479 | 7065 |
| 2442360 | 730a | 2509 | 4869 | 6768 | 2c09 | 0909 | 2020 | 2025 | 2068 | 6967 | 6820 | 7661 | 6c75 | 6520 | 666f | 7220 | 7363 | 616c | 6172 | 2074 | 7970 | 6573 | 0a25 | 0956 |
| 2442440 | 616c | 7565 | 732c | 0909 | 0920 | 2020 | 2520 | 6c69 | 7374 | 206f | 6620 | 7661 | 6c75 | 6573 | 2069 | 6620 | 656e | 756d | 6572 | 6174 | 696f | 6e20 | 7479 | 7065 |
| 2442520 | 0a25 | 0942 | 6974 | 7769 | 6474 | 682c | 0909 | 2020 | 2025 | 206e | 756d | 6265 | 7220 | 6f66 | 2062 | 6974 | 7320 | 2863 | 6f6d | 7075 | 7465 | 6420 | 6966 | 206e |
| 2442600 | 6563 | 6573 | 7361 | 7279 | 290a | 2509 | 5375 | 6274 | 7970 | 6509 | 0909 | 2020 | 2025 | 2073 | 7562 | 7479 | 7065 | 206e | 616d | 6520 | 6966 | 2063 | 6f6d | 706f |
| 2442660 | 7369 | 7465 | 0a25 | 0953 | 6f75 | 7263 | 655f | 6c69 | 6e65 | 5f6e | 756d | 6265 | 7209 | 2020 | 2025 | 2073 | 6f75 | 7263 | 6520 | 6c69 | 6e65 | 206e | 756d | 6265 |
| 2442740 | 7220 | 2869 | 6620 | 6176 | 6169 | 6c61 | 626c | 6529 | 0a25 | 2020 | 2020 | 292e | 0a25 | 0a25 | 2041 | 6363 | 6573 | 7320 | 4675 | 6e63 | 7469 | 6f6e | 7320 | 666f |
| 2443020 | 7220 | 7479 | 7065 | 2066 | 6965 | 6c64 | 732e | 0a25 | 0a74 | 7970 | 6528 | 7479 | 7065 | 285f | 2c5f | 2c5f | 2c5f | 2c5f | 2c5f | 2c5f | 2c5f | 2c5f | 2929 | 2e0a |
| 2443100 | 0a74 | 7970 | 655f | 6e61 | 6d65 | 2874 | 7970 | 6528 | 4e61 | 6d65 | 2c5f | 2c5f | 2c5f | 2c5f | 2c5f | 2c5f | 2c5f | 2c5f | 292c | 204e | 616d | 6529 | 2e0a | 7479 |
| 2443160 | 7065 | 5f61 | 7474 | 7269 | 6275 | 7465 | 2874 | 7970 | 6528 | 5f2c | 4174 | 7472 | 6962 | 7574 | 652c | 5f2c | 5f2c | 5f2c | 5f2c | 5f2c | 5f2c | 5f29 | 2c20 | 4174 |
| 2443240 | 7472 | 6962 | 7574 | 6529 | 2e0a | 7479 | 7065 | 5f73 | 7562 | 5f61 | 7474 | 7269 | 6275 | 7465 | 2874 | 7970 | 6528 | 5f2c | 5f2c | 5375 | 625f | 6174 | 7472 | 6962 |
| 2443320 | 7574 | 652c | 5f2c | 5f2c | 5f2c | 5f2c | 5f2c | 5f29 | 2c20 | 5375 | 625f | 6174 | 7472 | 6962 | 7574 | 6529 | 2e0a | 7479 | 7065 | 5f6c | 6f77 | 2874 | 7970 | 6528 |
| 2443400 | 5f2c | 5f2c | 5f2c | 4c6f | 772c | 5f2c | 5f2c | 5f2c | 5f2c | 5f29 | 2c20 | 4c6f | 7729 | 2e0a | 7479 | 7065 | 5f68 | 6967 | 6828 | 7479 | 7065 | 285f | 2c5f | 2c5f |
| 2443460 | 2c5f | 2c48 | 6967 | 682c | 5f2c | 5f2c | 5f2c | 5f29 | 2c20 | 4869 | 6768 | 292e | 0a74 | 7970 | 655f | 7661 | 6c75 | 6573 | 2874 | 7970 | 6528 | 5f2c | 5f2c | 5f2c |
| 2443540 | 5f2c | 5f2c | 5661 | 6c75 | 6573 | 2c5f | 2c5f | 2c5f | 292c | 2056 | 616c | 7565 | 7329 | 2e0a | 7479 | 7065 | 5f62 | 6974 | 7769 | 6474 | 6828 | 7479 | 7065 | 285f |
| 2443620 | 2c5f | 2c5f | 2c5f | 2c5f | 2c5f | 2c42 | 6974 | 7769 | 6474 | 682c | 5f2c | 5f2c | 5f29 | 2c20 | 4269 | 7477 | 6964 | 7468 | 292e | 0a74 | 7970 | 655f | 7375 | 6274 |
| 2443700 | 6528 | 7479 | 7065 | 285f | 2c5f | 2c5f | 2c5f | 2c5f | 2c5f | 2c5f | 2c53 | 7562 | 7479 | 7065 | 2c5f | 292c | 2053 | 7562 | 7479 | 7065 | 292e | 0a74 | 7970 | 655f |
| 2443760 | 736f | 7572 | 6365 | 5f6c | 696e | 655f | 6e75 | 6d62 | 6572 | 2874 | 7970 | 6528 | 5f2c | 5f2c | 5f2c | 5f2c | 5f2c | 5f2c | 5f2c | 5f2c | 4c29 | 2c20 | 4c29 | 2e0a |
| 2444040 | 250a | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 2444120 | 2525 | 2525 | 2525 | 2525 | 2525 | 2525 | 2525 | 2525 | 2525 | 2525 | 2525 | 2525 | 2525 | 2525 | 2525 | 2525 | 0a3a | 2d20 | 6479 | 6e61 | 6d69 | 6320 | 636f | 6e73 |
| 2444200 | 7461 | 6e74 | 732f | 372e | 0a25 | 636f | 6e73 | 7461 | 6e74 | 7328 | 4964 | 2c09 | 0909 | 2020 | 2025 | 2055 | 6e69 | 7175 | 656c | 7920 | 6964 | 656e | 7469 | 6669 |
| 2444260 | 6162 | 6c65 | 2069 | 640a | 2509 | 5479 | 7065 | 2c09 | 0909 | 2020 | 2025 | 2074 | 7970 | 6520 | 6966 | 2061 | 7070 | 6c69 | 6361 | 626c | 650a | 2509 | 4e61 | 6d65 |
| 2444340 | 2c09 | 0909 | 2020 | 2025 | 206e | 616d | 6520 | 6966 | 2061 | 6e79 | 0a25 | 0956 | 616c | 7565 | 2c09 | 0909 | 2020 | 2025 | 2063 | 6f6e | 7374 | 616e | 7420 | 7661 |

```
2444420 6c75 650a 2509 4269 7473 2c09 0909 2020 2025 206e 756d 6265 7220 6f66 2062 6974 730a 2509 5061 7265 6e74 2c09 0909 2020
2444500 2025 2069 6420 6f66 2070 726f 6362 6f64 7920 6465 636c 6172 6564 2069 6e0a 2509 536f 7572 6365 5f6c 696e 655f 6e75 6d62
2444560 6572 0920 2020 2520 736f 7572 6365 206c 696e 6520 6e75 6d62 6572 2028 6966 2061 7661 696c 6162 6c65 290a 2520 2020 2029
2444640 2e0a 250a 2520 4163 6365 7373 2066 756e 6374 696f 6e73 2066 6f72 2063 6f6e 7374 616e 7473 2066 6965 6c64 730a 636f 6e73
2444720 7461 6e74 2863 6f6e 7374 616e 7473 285f 2c5f 2c5f 2c5f 2c5f 2c5f 2c5f 2929 2e0a 0a63 6f6e 7374 616e 745f 6964 2863 6f6e
2445000 7374 616e 7473 2869 6428 632d 4d2c 5061 7265 6e74 292c 5f2c 5f2c 5f2c 5f2c 5061 7265 6e74 2c5f 292c 2069 6428 632d 4d2c
2445060 5061 7265 6e74 2929 2e0a 636f 6e73 7461 6e74 5f6e 616d 6528 636f 6e73 7461 6e74 7328 5f2c 4e61 6d65 2c5f 2c5f 2c5f 2c5f
2445140 2c5f 292c 204e 616d 6529 2e0a 636f 6e73 7461 6e74 5f76 616c 7565 2863 6f6e 7374 616e 7473 285f 2c5f 2c56 616c 7565 2c5f
2445220 2c5f 2c5f 2c5f 292c 2056 616c 7565 292e 0a63 6f6e 7374 616e 745f 6269 7473 2863 6f6e 7374 616e 7473 285f 2c5f 2c5f 2c42
2445300 6974 732c 5f2c 5f2c 5f29 2c20 4269 7473 292e 0a63 6f6e 7374 616e 745f 7479 7065 2863 6f6e 7374 616e 7473 285f 2c5f 2c5f
2445360 2c5f 2c54 7970 652c 5f2c 5f29 2c20 5479 7065 292e 0a63 6f6e 7374 616e 745f 7061 7265 6e74 2863 6f6e 7374 616e 7473 2869
2445440 6428 5f2c 5061 7265 6e74 292c 5f2c 5f2c 5f2c 5f2c 5061 7265 6e74 2c5f 292c 2050 6172 656e 7429 2e0a 636f 6e73 7461 6e74
2445520 5f73 6f75 7263 655f 6c69 6e65 5f6e 756d 6265 7228 636f 6e73 7461 6e74 7328 5f2c 5f2c 5f2c 5f2c 5f2c 5f2c 4c29 2c20 4c29
2445600 2e0a 0a63 6f6e 7374 616e 745f 6e75 6d62 6572 2843 6f6e 7374 616e 742c 204e 2920 3a2d 0a09 636f 6e73 7461 6e74 5f69 6428
2445660 436f 6e73 7461 6e74 2c20 6964 000c 1070 0400 630f 0000 3287 0000 0010 000a 18f0 0002 438a 0003 0068 0000 0000 0012 0f94
2445740 0e00 5ed7 0000 3287 0000 0038 000a 18f0 0002 438a 0003 0068 0000 0000 2c78 0016 0002 438a 5d10 0000 0e00 5ed7 5fb4 0038
2446020 228c 4b97 2cac 3470 0002 438a 2ca0 3470 0000 0000 0000 0001 0012 348c 0012 348c 0002 438a 0012 1440 0001 7000 2cac 315f
2446100 0002 438a 2ca0 4b97 0000 0000 0000 0001 0011 e324 0011 e324 0002 438a 0012 34f0 0011 e330 2c78 001c 0002 438a 5d10 0000
2446160 0e00 5ed7 5fa0 671c 5fb4 0030 49f8 228c 2cac 34cc 0002 438a 2ca0 26ef 0000 0000 0000 0001 0012 34f4 0012 34f4 0002 438a
2446240 0012 3534 0012 3500 2c78 001e 0002 438a 5d10 0000 0e00 5ed7 5fb4 0018 671c 5fb4 001c 48f8 228c 0000 2c78 001c 0002 438a
2446320 5d10 0000 0e00 5ed7 5f8c 671c 5fb4 002c 48f8 228c 2cac 3540 0002 438a 2ca0 3540 0000 0000 0000 0001 0012 3558 0012 3558
2446400 0002 438a 0012 3598 0012 3564 2c78 001c 0002 438a 5d10 0000 0e00 5ed7 5f78 671c 5fb4 0028 48f8 228c 2cac 1d03 0002 438a
2446460 2ca0 35a4 0000 0000 0000 0001 0012 359c 0012 359c 0002 438a 0012 35dc 0012 35a8 0008 ebec 0200 631f 0000 3287 0000 0008
2446540 0012 361c 0012 361c 0001 0068 0000 0000 2c78 001c 0002 438a 5d10 0000 0e00 5ed7 5f64 671c 5fb4 0024 48f8 228c 2cac 8cb0
2446620 0002 438a 2ca0 0580 0000 0000 0000 0001 0012 3600 0012 3600 0002 438a 0012 3640 0012 360c ffff ffff 0200 6327 0000 3287
2446700 0000 0008 0012 3684 0012 3684 0001 0068 0000 0000 2c78 001e 0002 438a 5d10 0000 0e00 5ed7 5fb4 0014 671c 5fb4 0020 48f8
2446760 228c 3644 2cac 8f80 0002 438a 2ca0 9c20 0000 0000 0000 0001 0012 3664 0012 3664 0002 438a 0012 36a8 0012 3670 0012 7072
2447040 6f63 626f 6479 5f6f 7065 7261 746f 7273 0000 0000 ffff ffff 0200 632f 0000 3287 0000 0008 0012 36e4 0012 36e4 0001 0068
2447120 0000 0000 2cac 31bc 0002 438a 2ca0 36a8 0000 0000 0000 0001 0012 3538 0012 3538 0002 438a 0012 3708 0012 3544 ffff ffff
2447200 0200 6337 0000 3287 0000 0008 0012 374c 0012 374c 0001 0068 0000 0000 2c78 001e 0002 438a 5d10 0000 0e00 5ed7 5fb4 001c
2447260 671c 5fb4 0018 48f8 228c 3708 2cac 8983 0002 438a 2ca0 371c 0000 0000 0000 0001 0012 372c 0012 372c 0002 438a 0012 3770
2447340 0012 3738 0010 7072 6f63 626f 6479 5f6f 7063 616c 6c73 003c ffff ffff 0200 633f 0000 3287 0000 0008 0012 37c8 0012 37c8
2447420 0001 0068 0000 0000 2c78 001e 0002 438a 5d10 0000 0e00 5ed7 5fb4 0020 671c 5fb4 0014 48f8 228c 4b48 2cac 3778 0002 438a
2447500 2ca0 156c 0000 0000 0000 0001 0012 3718 0012 37a8 0002 438a 0012 37ec 0012 37b4 0012 7072 6f63 626f 6479 5f63 6f6e 6469
2447560 7469 6f6e 0000 22d7 0008 c14c 0200 6347 0000 3287 0000 0008 0012 3844 0012 3844 0001 0068 0000 0000 2c78 001c 0002 438a
2447640 5d10 0000 0e00 5ed7 5fb4 0024 671c 5f64 48f8 228c 2cac a154 0002 438a 2ca0 fa28 0000 0000 0000 0001 0012 3828 0012 3828
2447720 0002 438a 0012 3868 0012 3834 0013 7072 6f63 626f 6479 5f61 7474 7269 6275 7465 7300 fa00 ffff ffff 0200 634f 0000 3287
2450000 0000 0008 0012 38c0 0012 38c0 0001 0068 0000 0000 2c78 001c 0002 438a 5d10 0000 0e00 5ed7 5fb4 0028 671c 5f78 48f8 228c
2450060 2cac fa04 0002 438a 2ca0 f90e 0000 0000 0000 0001 0012 38a4 0012 38a4 0002 438a 0012 38e4 0012 38b0 0013 7072 6f63 626f
2450140 6479 5f73 7563 6365 7373 6f72 7300 366c 0008 c16c 0200 6357 0000 3287 0000 0008 0012 3920 0012 3920 0001 0068 0000 0000
2450220 2c78 0020 0002 438a 2520 46ec 3310 247c 0012 0fe4 0014 37f0 3cf4 234c 0012 3950 ffff ffff 0200 635f 0000 3287 0000 0008
2450300 000a 18f0 000a 18f0 0000 0000 0000 0000 0014 7072 6f62 6f64 795f 7072 6564 6563 6573 736f 7273 0094 ffff ffff 0200 6367
2450360 0000 3287 0000 0008 0012 3998 0012 3998 0001 0068 0000 0000 2c78 0020 0002 438a 2520 46ec 3310 247c 0012 0fe4 0014 37f0
2450440 3cf4 234c 0012 39c8 ffff ffff 0200 636f 0000 3287 0000 0008 000a 18f0 000a 18f0 0000 0000 0000 0000 001b 7072 6f63 626f
2450520 6479 5f73 6f75 7263 655f 6c69 6e65 5f6e 756d 6265 7200 39a8 ffff ffff 0200 6377 0000 3287 0000 0008 0012 3a34 0012 3a34
2450600 0001 0068 0000 0000 2c78 001a 0002 438a 5d10 0000 0e00 5ed7 5fb4 0034 671c 48f8 228c 39e8 2cac 1b9c 0002 438a 2ca0 124c
2450660 0000 0000 0000 0001 0012 3a19 0012 3a18 0002 438a 0012 3a58 0012 3a24 000f 7072 6f63 626f 6479 5f6e 756d 6265 7200 2020
2450740 0010 d61c 0200 637f 0000 3287 0000 0008 0011 cff4 0011 cff4 0001 0068 0000 0000 0012 1010 0a00 5ebf 0000 3287 0000 0028
2451020 000a 18f0 0002 438a 0003 0068 0000 0000 2c78 0016 0002 438a 5d10 0000 0a00 5ebf 5fb4 0028 228c 124c 2cac 3a80 0002 438a
2451100 2ca0 3a80 0000 0000 0000 0001 0012 3ab0 0012 3ab0 0002 438a 0012 3aec 0012 3abc 2cac 1236 0002 438a 2ca0 1079 0000 0000
2451160 0000 0001 0011 e7ac 0011 e7ac 0002 438a 0012 3b14 0011 e7b8 2c78 001c 0002 438a 5d10 0000 0a00 5ebf 5fa0 671c 5fb4 0020
2451240 48f8 228c 2cac 3ae8 0002 438a 2ca0 0000 0000 0000 0001 0012 3b18 0012 3b18 0002 438a 0012 3b58 0012 3b24 0008 ec2c
2451320 0200 6387 0000 3287 0000 0008 0012 3b98 0012 3b98 0001 0068 0000 0000 2c78 001c 0002 438a 5d10 0000 0a00 5ebf 5f8c 671c
2451400 5fb4 001c 48f8 228c 2cac 121c 0002 438a 2ca0 3b70 0000 0000 0000 0001 0012 3b7c 0012 3b7c 0002 438a 0012 3bbc 0012 3b88
2451460 ffff ffff 0200 638f 0000 3287 0000 0008 0012 3bfc 0012 3bfc 0001 0068 0000 0000 2c78 001c 0002 438a 5d10 0000 0a00 5ebf
```

```
2451540  5f78 671c 5fb4 0018 48f8 228c 2cac 2020 0002 438a 2ca0 121c 0000 0000 0000 0001 0012 3be0 0012 3be0 0002 438a 0012 3c20
2451620  0012 3bec 2c78 001c 0002 438a 5d10 0000 0a00 5ebf 5f64 671c 5fb4 0014 48f8 228c 2cac 3c10 0002 438a 2ca0 3c10 0000 0000
2451700  0000 0001 0012 3c24 0012 3c24 0002 438a 0012 3c64 0012 3c30 2c78 001c 0002 438a 5d10 0000 0a00 5ebf 5fb4 0014 671c 5f64
2451760  48f8 228c 2cac 1200 0002 438a 2ca0 0567 0000 0000 0000 0001 0012 3c68 0012 3c68 0002 438a 0012 3ca8 0012 3c74 0013 6f70
2452040  6572 6174 6f72 5f61 7474 7269 6275 7465 7300 0000 000c 18dc 0200 6397 0000 3287 0000 0008 0012 3d00 0012 3d00 0001 0068
2452120  0000 0000 2c78 001c 0002 438a 5d10 0000 0a00 5ebf 5fb4 0018 671c 5f78 48f8 228c 2cac 3cb8 0002 438a 2ca0 3608 0000 0000
2452200  0000 0001 0012 3ce4 0012 3ce4 0002 438a 0012 3d24 0012 3cf0 2c78 0028 0002 438a 5d10 0000 0a00 5ebf 6784 5fb4 0018 671c
2452260  5f8c 5bc4 0200 61bf 5fa0 6b74 48f8 228c 2cac 3d08 0002 438a 2ca0 3608 0000 0000 0000 0001 0012 3d28 0012 3d28 0002 438a
2452340  0012 3d74 0012 3d34 0011 6f70 6572 6174 6f72 5f62 6974 7769 6474 6800 0008 ec6c 0200 639f 0000 3287 0000 0008 0012 3dc8
2452420  0012 3dc8 0001 0068 0000 0000 2c78 001c 0002 438a 5d10 0000 0a00 5ebf 5fb4 0020 671c 5fa0 48f8 228c 2cac 11d4 0002 438a
2452500  2ca0 3da0 0000 0000 0000 0001 0012 3dac 0012 3dac 0002 438a 0012 3dec 0012 3db8 001b 6f70 6572 6174 6f72 5f73 6f75 7263
2452560  655f 6c69 6e65 5f6e 756d 6265 7200 0000 000a da8c 0200 63a7 0000 3287 0000 0008 0012 3e4c 0012 3e4c 0001 0068 0000 0000
2452640  2c78 001a 0002 438a 5d10 0000 0a00 5ebf 5fb4 0024 671c 48f8 228c 3608 2cac 11c4 0002 438a 2ca0 3e08 0000 0000 0000 0001
2452720  0012 3e30 0012 3e30 0002 438a 0012 3e70 0012 3e3c 0008 c24c 0a00 63af 0000 3287 0000 0028 000a 18f0 0002 438a 0003 0068
2453000  0000 0000 0012 3e74 0100 63af 0000 3287 0000 0004 0012 3ecc 0012 3ecc 0001 0068 0000 0000 2c78 0016 0002 438a 5d10 0000
2453060  0a00 63af 5fb4 0028 228c 3e90 2cac 2020 0002 438a 2ca0 11c4 0000 0000 0000 0001 0012 3eb4 0012 3eb4 0002 438a 0012 3ef0
2453140  0012 3ec0 2cac 3ea8 0002 438a 2ca0 0000 0000 0000 0000 0001 0011 eb04 0011 eb04 0002 438a 0012 3f18 0011 eb10 2c78 001c
2453220  0002 438a 5d10 0000 0a00 63af 5fa0 671c 5fb4 0020 48f8 228c 2cac 3608 0002 438a 2ca0 11a0 0000 0000 0000 0001 0012 3f1c
2453300  0012 3f1c 0002 438a 0012 3f5c 0012 3f28 2c78 001c 0002 438a 5d10 0000 0a00 63af 5f8c 671c 5fb4 001c 48f8 228c 2cac 287c
2453360  0002 438a 2ca0 119c 0000 0000 0000 0001 0012 3f60 0012 3f60 0002 438a 0012 3fa0 0012 3f6c 0008 eccc 0200 63b7 0000 3287
2453440  0000 0008 0012 3fe0 0012 3fe0 0001 0068 0000 0000 2c78 001c 0002 438a 5d10 0000 0a00 63af 5f78 671c 5fb4 0018 48f8 228c
2453520  2cac 83e4 0002 438a 2ca0 90dc 0000 0000 0000 0001 0012 3fc4 0012 3fc4 0002 438a 0012 4004 0012 3fd0 2c78 001c 0002 438a
2453600  5d10 0000 0a00 63af 5f64 671c 5fb4 0014 48f8 228c 2cac 1b9c 0002 438a 2ca0 4018 0000 0000 0000 0001 0012 4008 0012 4008
2453660  0002 438a 0012 4048 0012 4014 2c78 001c 0002 438a 5d10 0000 0a00 63af 5fb4 0014 671c 5f64 48f8 228c 2cac 31c4 0002 438a
2453740  2ca0 4028 0000 0000 0000 0001 0012 404c 0012 404c 0002 438a 0012 408c 0012 4058 2c78 0028 0002 438a 5d10 0000 0a00 63af
2454020  6784 5fb4 0014 671c 5f78 5bc4 0200 61bf 5fa0 6b74 48f8 228c 2cac 31c4 0002 438a 2ca0 4078 0000 0000 0000 0001 0012 4090
2454100  0012 4090 0002 438a 0012 40dc 0012 409c 2c78 001c 0002 438a 5d10 0000 0a00 63af 5fb4 001c 671c 5f8c 48f8 228c 2cac 2020
2454160  0002 438a 2ca0 83c8 0000 0000 0000 0001 0012 40e0 0012 40e0 0002 438a 0012 4120 0012 40ec 0011 696f 6e6f 6465 5f61 7474
2454240  7269 6275 7465 7300 0008 c26c 0200 63bf 0000 3287 0000 0008 0012 4174 0012 4174 0001 0068 0000 0000 2c78 001c 0002 438a
2454320  5d10 0000 0a00 63af 5fb4 0020 671c 5fa0 48f8 228c 2cac 83a0 0002 438a 2ca0 05b1 0000 0000 0000 0001 0012 4158 0012 4158
2454400  0002 438a 0012 4198 0012 4164 0019 696f 6e6f 6465 5f73 6f75 7263 655f 6c69 6e65 5f6e 756d 6265 7200 0008 c28c 0200 63c7
2454460  0000 3287 0000 0008 0012 41f4 0012 41f4 0001 0068 0000 0000 2c78 001a 0002 438a 5d10 0000 0a00 63af 5fb4 0024 671c 48f8
2454540  228c 31c4 2cac 8398 0002 438a 2ca0 8388 0000 0000 0000 0001 0012 41d8 0012 41d8 0002 438a 0012 4218 0012 41e4 0012 0db4
2454620  0600 32e7 0000 3287 0000 0018 000a 18f0 0002 438a 0003 0068 0000 0000 0012 421c 0100 32e7 0000 3287 0000 0004 0012 4274
2454700  0012 4274 0001 0068 0000 0000 2c78 0016 0002 438a 5d10 0000 0600 32e7 5fb4 0018 228c 8372 2cac 836c 0002 438a 2ca0 0567
2454760  0000 0000 0000 0001 0012 425c 0012 425c 0002 438a 0012 4298 0012 4268 2cac 1c94 0002 438a 2ca0 1b9c 0000 0000 0000 0001
2455040  0011 eeec 0011 eeec 0002 438a 0012 42c0 0011 eef8 0008 c2cc 0200 63cf 0000 3287 0000 0008 0012 4300 0012 4300 0001 0068
2455120  0000 0000 2c7d 001a 0002 438a 5d10 0000 0600 32e7 5fa0 671c 5f64 48f8 228c 8358 2cac 835c 0002 438a 2ca0 90dc 0000 0000
2455200  0000 0001 0012 42e4 0012 42e4 0002 438a 0012 4324 0012 42f0 0019 7661 7269 6162 6c65 5f64 6563 6c61 7261 7469 6f6e 5f74
2455260  7970 6500 0008 c30c 0200 63d7 0000 3287 0000 0008 0012 4380 0012 4380 0001 0068 0000 0000 2c78 001a 0002 438a 5d10 0000
2455340  0600 32e7 5f8c 671c 5f78 48f8 228c 2020 2cac 31c4 0002 438a 2ca0 31c4 0000 0000 0000 0001 0012 4364 0012 4364 0002 438a
2455420  0012 43a4 0012 4370 2c78 0028 0002 438a 5d10 0000 0600 32e7 6784 5f8c 671c 5f8c 5de8 0000 0200 61bf 5fa0 6b74 48f8 228c
2455500  2cac 31c4 0002 438a 2ca0 4390 0000 0000 0000 0001 0012 43a8 0012 43a8 0002 438a 0012 43f4 0012 43b4 2c78 001a 0002 438a
2455560  5d10 0000 0600 32e7 5f64 671c 5fa0 48f8 228c 8880 2cac 31c4 0002 438a 2ca0 2020 0000 0000 0000 0001 0012 43f8 0012 43f8
2455640  0002 438a 0012 4438 0012 4404 001b 7661 7269 6162 6c65 5f73 6f75 7263 655f 6c69 6e65 5f6e 756d 6265 7200 7339 0008 c34c
2455720  0200 63df 0000 3287 0000 0008 0012 4498 0012 4498 0001 0068 0000 0000 2c78 001a 0002 438a 5d10 0000 0600 32e7 5fb4 0018
2456000  671c 48f8 228c 4448 2cac 90dc 0002 438a 2ca0 831a 0000 0000 0000 0001 0012 447c 0012 447c 0002 438a 0012 44bc 0012 4488
2456060  000f 7661 7269 6162 6c65 5f6e 756d 6265 7200 4488 ffff ffff 0200 63e7 0000 3287 0000 0008 0011 f090 0011 f090 0001 0068
2456140  0000 0000 0012 3e10 0900 53a7 0000 3287 0000 0024 000a 18f0 0002 438a 0003 0068 0000 0000 0012 44f4 0100 53a7 0000 3287
2456220  0000 0004 0012 454c 0012 454c 0001 0068 0000 0000 2c78 0016 0002 438a 5d10 0000 0900 53a7 5fb4 0024 228c 26f8 2cac 4518
2456300  0002 438a 2ca0 31c4 0000 0000 0000 0001 0012 4534 0012 4534 0002 438a 0012 4570 0012 4540 0010 a798 0200 31bf 0000 3287
2456360  0000 0008 0012 45b0 0012 45b0 0001 0068 0000 0000 2c78 001a 0002 438a 5d10 0000 0900 53a7 671c 5fb4 0020 48f8 228c 2020
2456440  2cac 31c4 0002 438a 2ca0 31c4 0000 0000 0000 0001 0012 4594 0012 4594 0002 438a 0012 45d4 0012 45a0 000e 7479 7065 5f61
2456520  7474 7269 6275 7465 000f 82d0 0010 ad18 0200 63ef 0000 3287 0000 0008 0012 4628 0012 4628 0001 0068 0000 0000 2c78 001c
2456600  0002 438a 5d10 0000 0900 53a7 5fa0 671c 5fb4 001c 48f8 228c 2cac 90dc 0002 438a 2ca0 82ca 0000 0000 0000 0001 0012 460c
```

| | | | | | | | | | | | | | | | | | | | | | | | | |
|---|---|---|---|---|---|---|---|---|---|---|---|---|---|---|---|---|---|---|---|---|---|---|---|---|
| 2456660 | 0012 | 460c | 0002 | 438a | 0012 | 464c | 0012 | 4618 | 0012 | 7479 | 7065 | 5f73 | 7562 | 5f61 | 7474 | 7269 | 6275 | 7465 | 0005 | 1b9c | 0010 | d37c | 0200 | 63f7 |
| 2456740 | 0000 | 3287 | 0000 | 0008 | 0012 | 46a4 | 0012 | 46a4 | 0001 | 0068 | 0000 | 0000 | 2c78 | 001c | 0002 | 438a | 5d10 | 0000 | 0900 | 53a7 | 5f8c | 671c | 5fb4 | 0018 |
| 2457020 | 48f8 | 228c | 2cac | 82c0 | 0002 | 438a | 2ca0 | 82b0 | 0000 | 0000 | 0000 | 0001 | 0012 | 4688 | 0012 | 4688 | 0002 | 438a | 0012 | 46c8 | 0012 | 4694 | 0008 | c3ac |
| 2457100 | 0200 | 63ff | 0000 | 3287 | 0000 | 0008 | 0012 | 4708 | 0012 | 4708 | 0001 | 0068 | 0000 | 0000 | 2c78 | 001c | 0002 | 438a | 5d10 | 0000 | 0900 | 53a7 | 5f78 | 671c |
| 2457160 | 5fb4 | 0014 | 48f8 | 228c | 2cac | 3608 | 0002 | 438a | 2ca0 | 82ac | 0000 | 0000 | 0000 | 0001 | 0012 | 46ec | 0012 | 46ec | 0002 | 438a | 0012 | 472c | 0012 | 46f8 |
| 2457240 | 0010 | d39c | 0200 | 6407 | 0000 | 3287 | 0000 | 0008 | 0012 | 476c | 0012 | 476c | 0001 | 0068 | 0000 | 0000 | 2c78 | 001a | 0002 | 438a | 5d10 | 0000 | 0900 | 53a7 |
| 2457320 | 5f64 | 671c | 5f64 | 48f8 | 228c | 90dc | 2cac | 0000 | 0002 | 438a | 2ca0 | 828c | 0000 | 0000 | 0000 | 0001 | 0012 | 4750 | 0012 | 4750 | 0002 | 438a | 0012 | 4790 |
| 2457400 | 0012 | 475c | 0010 | d3bc | 0200 | 640f | 0000 | 3287 | 0000 | 0008 | 0012 | 47d0 | 0012 | 47d0 | 0001 | 0068 | 0000 | 0000 | 2c78 | 001c | 0002 | 438a | 5d10 | 0000 |
| 2457460 | 0900 | 53a7 | 5fb4 | 0014 | 671c | 5f78 | 48f8 | 228c | 2cac | 9880 | 0002 | 438a | 2ca0 | 8290 | 0000 | 0000 | 0000 | 0001 | 0012 | 47b4 | 0012 | 47b4 | 0002 | 438a |
| 2457540 | 0012 | 47f4 | 0012 | 47c0 | 0010 | d3dc | 0200 | 6417 | 0000 | 3287 | 0000 | 0008 | 0012 | 4834 | 0012 | 4834 | 0001 | 0068 | 0000 | 0000 | 2c78 | 001c | 0002 | 438a |
| 2457620 | 5d10 | 0000 | 0900 | 53a7 | 5fb4 | 0018 | 671c | 5f8c | 48f8 | 228c | 2cac | 9280 | 0002 | 438a | 2ca0 | 8270 | 0000 | 0000 | 0000 | 0001 | 0012 | 4818 | 0012 | 4818 |
| 2457700 | 0002 | 438a | 0012 | 4858 | 0012 | 4824 | 0010 | d3fc | 0200 | 641f | 0000 | 3287 | 0000 | 0008 | 0012 | 4898 | 0012 | 4898 | 0001 | 0068 | 0000 | 0000 | 2c78 | 001c |
| 2457760 | 0002 | 438a | 5d10 | 0000 | 0900 | 53a7 | 5fb4 | 001c | 671c | 5fa0 | 48f8 | 228c | 2cac | 3608 | 0002 | 438a | 2ca0 | 825c | 0000 | 0000 | 0000 | 0001 | 0012 | 487c |
| 2460040 | 0012 | 487c | 0002 | 438a | 0012 | 48bc | 0012 | 4898 | 0017 | 7479 | 7065 | 5f73 | 6f75 | 7263 | 655f | 6c69 | 6e65 | 5f6e | 756d | 6265 | 7200 | 4890 | 0010 | d42c |
| 2460120 | 0200 | 6427 | 0000 | 3287 | 0000 | 0008 | 0012 | 4918 | 0012 | 4918 | 0001 | 0068 | 0000 | 0000 | 2c78 | 001a | 0002 | 438a | 5d10 | 0000 | 0900 | 53a7 | 5fb4 | 0020 |
| 2460200 | 671c | 48f8 | 228c | 31c4 | 2cac | 8258 | 0002 | 438a | 2ca0 | 31c4 | 0000 | 0000 | 0000 | 0001 | 0012 | 48fc | 0012 | 48fc | 0002 | 438a | 0012 | 493c | 0012 | 4908 |
| 2460260 | 0010 | d44c | 0700 | 642f | 0000 | 3287 | 0000 | 001c | 000a | 18f0 | 0002 | 438a | 0003 | 0068 | 0000 | 0000 | 000f | cb78 | 0100 | 1ff7 | 0000 | 3287 | 0000 | 0004 |
| 2460340 | 0012 | 4998 | 0012 | 4998 | 0001 | 0068 | 0000 | 0000 | 2c78 | 0016 | 0002 | 438a | 5d10 | 0000 | 0700 | 642f | 5fb4 | 001c | 228c | 4948 | 2cac | 90dc | 0002 | 438a |
| 2460420 | 2ca0 | 823a | 0000 | 0000 | 0000 | 0001 | 0012 | 4980 | 0012 | 4980 | 0002 | 438a | 0012 | 49bc | 0012 | 498c | 2cac | 31c4 | 0002 | 438a | 2ca0 | 31c4 | 0000 | 0000 |
| 2460500 | 0000 | 0001 | 0011 | f3cc | 0011 | f3cc | 0002 | 438a | 0012 | 49e4 | 0011 | f3d8 | 2c78 | 001c | 0002 | 438a | 5d10 | 0000 | 0700 | 642f | 5fa0 | 671c | 5fb4 | 0014 |
| 2460560 | 48f8 | 228c | 2cac | 1c94 | 0002 | 438a | 2ca0 | 2020 | 0000 | 0000 | 0000 | 0001 | 0012 | 49e8 | 0012 | 49e8 | 0002 | 438a | 0012 | 4a28 | 0012 | 49f4 | 2c78 | 001a |
| 2460640 | 0002 | 438a | 5d10 | 0000 | 0700 | 642f | 5f8c | 671c | 5f64 | 48f8 | 228c | 4a18 | 2cac | 26f8 | 0002 | 438a | 2ca0 | 9880 | 0000 | 0000 | 0000 | 0001 | 0012 | 4a2c |
| 2460720 | 0012 | 4a2c | 0002 | 438a | 0012 | 4a6c | 0012 | 4a38 | 0010 | d4c8 | 0200 | 6437 | 0000 | 3287 | 0000 | 0008 | 0012 | 4aac | 0012 | 4aac | 0001 | 0068 | 0000 | 0000 |
| 2461000 | 2c78 | 001a | 0002 | 438a | 5d10 | 0000 | 0700 | 642f | 5f78 | 671c | 5f78 | 48f8 | 228c | 4a70 | 2cac | 2020 | 0002 | 438a | 2ca0 | 8210 | 0000 | 0000 | 0000 | 0001 |
| 2461060 | 0012 | 4a90 | 0012 | 4a90 | 0002 | 438a | 0012 | 4ad0 | 0012 | 4a9c | 0010 | d4e8 | 0200 | 643f | 0000 | 3287 | 0000 | 0008 | 0012 | 4b10 | 0012 | 4b10 | 0001 | 0068 |
| 2461140 | 0000 | 0000 | 2c78 | 001a | 0002 | 438a | 5d10 | 0000 | 0700 | 642f | 5f64 | 671c | 5f8c | 48f8 | 228c | 81f8 | 2cac | 4ac8 | 0002 | 438a | 2ca0 | 3608 | 0000 | 0000 |
| 2461220 | 0000 | 0001 | 0012 | 4af4 | 0012 | 4af4 | 0002 | 438a | 0012 | 4b34 | 0012 | 4b00 | 000f | 636f | 6e73 | 7461 | 6e74 | 5f70 | 6172 | 656e | 7400 | 4b10 | 0010 | d570 |
| 2461300 | 0200 | 6447 | 0000 | 3287 | 0000 | 0008 | 0012 | 4b94 | 0012 | 4b94 | 0001 | 0068 | 0000 | 0000 | 2c78 | 0028 | 0002 | 438a | 5d10 | 0000 | 0700 | 642f | 6784 | 5f64 |
| 2461360 | 671c | 5fa0 | 5de8 | 0000 | 0200 | 61bf | 5fa0 | 6b74 | 48f8 | 228c | 2cac | 31c4 | 0002 | 438a | 2ca0 | 2020 | 0000 | 0000 | 0000 | 0001 | 0012 | 4b6c | 0012 | 4b6c |
| 2461440 | 0002 | 438a | 0012 | 4bb8 | 0012 | 4b78 | 001b | 636f | 6e73 | 7461 | 6e74 | 5f73 | 6f75 | 7263 | 655f | 6c69 | 6e65 | 5f6e | 756d | 6265 | 7200 | 7561 | 0011 | 4ef0 |
| 2461520 | 0200 | 644f | 0000 | 3287 | 0000 | 0008 | 0012 | 4c18 | 0012 | 4c18 | 0001 | 0068 | 0000 | 0000 | 2c78 | 001a | 0002 | 438a | 5d10 | 0000 | 0700 | 642f | 5fb4 | 0018 |
| 2461600 | 671c | 48f8 | 228c | 4bc8 | 2cac | 90dc | 0002 | 438a | 2ca0 | 81ca | 0000 | 0000 | 0000 | 0001 | 0012 | 4bfc | 0012 | 4bfc | 0002 | 438a | 0012 | 4c3c | 0012 | 4c08 |
| 2461660 | 000f | 636f | 6e73 | 7461 | 6e74 | 5f6e | 756d | 6265 | 7200 | 4c08 | 0010 | d63c | 0200 | 6457 | 0000 | 3287 | 0000 | 0008 | 0011 | f6c8 | 0011 | f6c8 | 0001 | 0068 |
| 2461740 | 0000 | 0000 | 0013 | 696e | 7465 | 726d | 6564 | 6961 | 7465 | 5f6e | 756d | 6265 | 7200 | 4c50 | 0001 | 7400 | 2cac | 31c4 | 0002 | 438a | 2ca0 | 4c50 | 0000 | 0000 |
| 2462020 | 0000 | 0001 | 0011 | f72c | 0011 | f72c | 0002 | 438a | 0012 | 4cb4 | 0011 | f738 | 0013 | 696e | 7465 | 726d | 6564 | 6961 | 7465 | 5f70 | 6172 | 656e | 7400 | 4c98 |
| 2462100 | 0010 | d6bc | 0200 | 646f | 0000 | 3287 | 0000 | 0008 | 0012 | 4d18 | 0012 | 4d18 | 0001 | 0068 | 0000 | 0000 | 2c78 | 0026 | 0002 | 438a | 5d10 | 0000 | 0200 | 61bf |
| 2462160 | 62c0 | 5bc4 | 0200 | 0ad7 | 4b8c | 0000 | 0000 | 6467 | 5fa0 | 48f8 | 228c | 8192 | 2cac | 75bd | 0002 | 438a | 2ca0 | 4cf0 | 0000 | 0000 | 0000 | 0001 | 0012 | 4cf0 |
| 2462240 | 0012 | 4cf0 | 0002 | 438a | 0012 | 4d3c | 0012 | 4cfc | 000e | 636f | 6e74 | 726f | 6c5f | 6e75 | 6d62 | 6572 | 000f | 8194 | 0011 | 1ccc | 0200 | 6477 | 0000 | 3287 |
| 2462320 | 0000 | 0008 | 0012 | 4d74 | 0012 | 4d74 | 0001 | 0068 | 0000 | 0000 | 2cac | 1c94 | 0002 | 438a | 2ca0 | 2020 | 0000 | 0000 | 0000 | 0001 | 0011 | f7c8 | 0011 | f7c8 |
| 2462400 | 0002 | 438a | 0012 | 4d98 | 0011 | f7d4 | 000e | 636f | 6e74 | 726f | 6c5f | 7061 | 7265 | 6e74 | 0000 | 0000 | 0010 | d89c | 0200 | 6487 | 0000 | 3287 | 0000 | 0008 |
| 2462460 | 0012 | 4df8 | 0012 | 4df8 | 0001 | 0068 | 0000 | 0000 | 2c78 | 0026 | 0002 | 438a | 5d10 | 0000 | 0200 | 61bf | 62c0 | 5bc4 | 0200 | 0ad7 | 4b8c | 0000 | 0000 | 647f |
| 2462540 | 5fa0 | 48f8 | 228c | 8170 | 2cac | 7605 | 0002 | 438a | 2ca0 | 7605 | 0000 | 0000 | 0000 | 0001 | 0012 | 4dd0 | 0012 | 4dd0 | 0002 | 438a | 0012 | 4e1c | 0012 | 4ddc |
| 2462620 | 0010 | ea24 | 0100 | 648f | 0000 | 3287 | 0000 | 0004 | 0012 | 4e64 | 0012 | 4e64 | 0001 | 0068 | 0000 | 0000 | 2c78 | 0024 | 0002 | 438a | 5d10 | 0000 | 0100 | 61bf |
| 2462700 | 5a18 | 0000 | 0200 | 0ad7 | 4b8c | 0000 | 0000 | 6317 | 5fa0 | 228c | 2cac | 1c94 | 0002 | 438a | 2ca0 | 2020 | 0000 | 0000 | 0000 | 0001 | 0012 | 4e40 | 0012 | 4e40 |
| 2462760 | 0002 | 438a | 0012 | 4e88 | 0012 | 4e4c | 0010 | ea54 | 0100 | 6497 | 0000 | 3287 | 0000 | 0004 | 0012 | 4ed4 | 0012 | 4ed4 | 0001 | 0068 | 0000 | 0000 | 2c78 | 0028 |
| 2463040 | 0002 | 438a | 5d10 | 0000 | 0200 | 61bf | 671c | 5fa0 | 5d10 | 0000 | 0200 | 0ad7 | 4b8c | 0000 | 0000 | 2ad7 | 5fa0 | 228c | 2cac | 1b9c | 0002 | 438a | 2ca0 | 8140 |
| 2463120 | 0000 | 0000 | 0000 | 0001 | 0012 | 4eac | 0012 | 4eac | 0002 | 438a | 0012 | 4ef8 | 0012 | 4eb8 | 2c78 | 0028 | 0002 | 438a | 5d10 | 0000 | 0200 | 61bf | 671c | 5fa0 |
| 2463200 | 5d10 | 0000 | 0200 | 0ad7 | 4b8c | 0000 | 0000 | 5ec7 | 5fa0 | 228c | 2cac | 1b9c | 0002 | 438a | 2ca0 | 4f18 | 0000 | 0000 | 0000 | 0001 | 0012 | 4efc | 0012 | 4efc |
| 2463260 | 0002 | 438a | 0012 | 4f48 | 0012 | 4f08 | 2c78 | 0028 | 0002 | 438a | 5d10 | 0000 | 0200 | 61bf | 671c | 5fa0 | 5d10 | 0000 | 0200 | 0ad7 | 4b8c | 0000 | 0000 | 32cf |
| 2463340 | 5fa0 | 228c | 2cac | 1b9c | 0002 | 438a | 2ca0 | 8128 | 0000 | 0000 | 0000 | 0001 | 0012 | 4f4c | 0012 | 4f4c | 0002 | 438a | 0012 | 4f98 | 0012 | 4f58 | 2c78 | 0028 |
| 2463420 | 0002 | 438a | 5d10 | 0000 | 0200 | 61bf | 671c | 5fa0 | 5d10 | 0000 | 0200 | 0ad7 | 4b8c | 0000 | 0000 | 1e9f | 5fa0 | 228c | 2cac | 1b9c | 0002 | 438a | 2ca0 | 8120 |
| 2463500 | 0000 | 0000 | 0000 | 0001 | 0012 | 4f9c | 0012 | 4f7c | 0002 | 438a | 0012 | 4fe8 | 0012 | 4fa8 | 000f | 6973 | 5f69 | 6e74 | 6572 | 6d65 | 6469 | 6174 | 6500 | 2020 |
| 2463560 | 0010 | d9ac | 0100 | 649f | 0000 | 3287 | 0000 | 0004 | 0012 | 5048 | 0012 | 5048 | 0001 | 0068 | 0000 | 0000 | 2c78 | 0028 | 0002 | 438a | 5d10 | 0000 | 0200 | 61bf |
| 2463640 | 671c | 5fa0 | 5d10 | 0000 | 0200 | 0ad7 | 4b8c | 0000 | 0000 | 6467 | 5fa0 | 228c | 2cac | 5010 | 0002 | 438a | 2ca0 | 31c4 | 0000 | 0000 | 0000 | 0001 | 0012 | 5020 |
| 2463720 | 0012 | 5020 | 0002 | 438a | 0012 | 506c | 0012 | 502c | 0010 | da7c | 0100 | 64a7 | 0000 | 3287 | 0000 | 0004 | 0012 | 50b8 | 0012 | 50b8 | 0001 | 0068 | 0000 | 0000 |

```
2464000  2c78 0028 0002 438a 5d10 0000 0200 61bf 571c 5fa0 5d10 0000 0200 0ad7 4b8c 0000 0000 647f 5fa0 228c 2cac 3608 0002 438a
2464060  2ca0 80f4 0000 0000 0000 0001 0012 5090 0012 5090 0002 438a 0012 50dc 0012 509c 0008 c52c 0200 64af 0000 3287 0000 0008
2464140  0012 5100 0012 5100 0001 0068 0000 0000 2cac 50b8 0002 438a 2ca0 3608 0000 001c 0000 0007 0011 f9ec 0011 fb08 0002 438a
2464220  0012 5124 0000 0000 0000 0000 0011 f9f8 0000 0000 0011 fa84 0011 fa54 000a 3555 0011 fa24 001c 636c 6561 725f 6461 7461
2464300  7374 7275 6374 7572 655f 656c 656d 656e 7473 00d4 0008 c54c 0000 64bf 0000 3287 0000 0000 0011 fb70 0011 fb70 0001 0068
2464360  0000 0000 0012 5248 0000 002c 0011 7114 7fff ffff 0000 0000 0000 0000 0000 0014 0011 7318 7fff ffff 0012 5184 0000 0000
2464440  2c78 0028 0002 438a 45c4 39f8 0012 4e30 0014 37f0 3280 247c 0012 017c 0010 3cf4 242c 0000 0012 760c 0000 002c 0012 79f8
2464520  b27c b66c 0000 0bd8 7fff ffff 0012 144c 0200 0db5 0200 2f35 0000 62f7 0000 0353 0000 315f 0000 002c 0012 7a24 b27c b66c
2464600  0000 0be1 7fff ffff 0012 1478 0200 0db5 0200 224d 0000 62f7 0000 3287 0000 315f 000e 656e 7469 7479 5f6f 7574 7075 7473
2464660  0000 0000 0012 544c 0000 00c8 b27c b66c 0000 0b1a 0000 0be0 000a d164 0200 0db5 0200 270d 0000 62f7 0000 3287 0000 315f
2464740  0012 52ac 0000 0038 b27c b66c 0000 0bdb 0000 0be2 0012 52dc 0200 0db5 0500 1cdd 0000 5f87 0000 0013 0000 3287 008f fd03
2465020  0000 0353 0000 315f 0012 52d8 0000 002c b4f0 b4e4 0000 0bda 7fff ffff 0008 b0dd 0000 0000 0000 0000 0012 5568 0002 438a
2465100  000e 8670 0012 544c 0000 0038 b27c b66c 0000 0bdc 0000 0be3 0012 5450 0200 0db5 0500 1cdd 0000 625f 0000 0013 0000 3287
2465160  0090 8fc3 0000 0353 0000 315f 2938 0038 0012 5344 4e1c 0000 0000 52b7 2520 46d8 4254 0000 0000 52b7 3b4c 0000 0012 10d0
2465240  0010 37dc 4300 0000 0000 5ed7 0012 11f8 000c 2eb0 28c4 0038 0012 537c 4e1c 0000 0000 5237 2520 46d8 4254 0000 0000 5237
2465320  3b4c 0000 0012 10d0 0010 37dc 4300 0000 0000 5ed7 0012 11f8 000c 2eb0 28c4 0038 0012 53b4 4e1c 0000 0000 5347 2520 46d8
2465400  4254 0000 0000 5347 3b4c 0000 0012 10d0 0010 37dc 4300 0000 0000 5ed7 0012 11f8 000c 2eb0 28c4 0038 0012 53ec 4e1c 0000
2465460  0000 5ee7 2520 46d8 4254 0000 0000 5ee7 3b4c 0000 0012 10d0 0010 37dc 4300 0000 0000 5ed7 0012 11f8 000c 2eb0 28c4 005c
2465540  0012 9adc 4e1c 0000 0000 6287 2520 46ec 37f0 42ac 0000 5ed7 0012 11f8 0014 3310 3ba0 0000 0012 10d0 0010 4550 4b9c 0000
2465620  0000 52b7 5370 4538 4b8c 0000 0000 5237 6bb4 4550 4b8c 0000 0000 5347 6b74 4064 000c 4138 000c 2eb0 0012 5564 0000 0038
2465700  b27c b66c 0000 0bdd 0000 0be4 0012 5568 0200 0db5 0500 1cdd 0000 5f8f 0000 0013 0000 3287 008f ff23 0000 0353 0000 315f
2465760  2938 0038 0012 54b8 4e1c 0000 0000 52b7 2520 46d8 4254 0000 0000 52b7 3b4c 0000 0012 10d0 0010 37dc 4240 0000 0000 5ed7
2466040  242c 0000 0011 ffe4 28c4 0038 0012 54f0 4e1c 0000 0000 5237 2520 46d8 4254 0000 0000 5237 3b4c 0000 0012 10d0 0010 37dc
2466120  4240 0000 0000 5ed7 242c 0000 0011 ffe4 28c4 0038 0012 5528 4e1c 0000 0000 5347 2520 46d8 4254 0000 0000 5347 3b4c 0000
2466200  0012 10d0 0010 37dc 4240 0000 0000 5ed7 242c 0000 0011 ffe4 28c4 0038 0012 9b1c 4e1c 0000 0000 5ee7 2520 46d8 4254 0000
2466260  0000 5ee7 3b4c 0000 0012 10d0 0010 37dc 4240 0000 0000 5ed7 242c 0000 0011 ffe4 0012 55f0 0000 0038 b130 b66c 0000 0bde
2466340  0000 0be5 0012 52b1 0200 0db5 0500 1cdd 0000 674f 0000 000b 0000 3287 0094 db23 0000 0353 0000 315f 2c78 0054 0002 438a
2466420  45b8 9300 9460 0036 2e7c ada8 2ba0 0014 001a 320c 4300 0000 0000 6757 0011 ffe4 0014 aa34 2e98 2c88 0004 2c58 37dc 41d4
2466500  0000 6757 242c 0000 0011 ffa0 37dc 41d4 0000 6757 242c 0000 0012 11f8 0012 7a60 0000 1bcc 284f 7032 2c20 5072 6f63 292e
2466560  0a0a 2525 2525 2525 2525 2525 2525 2525 2525 2525 2525 2525 2525 2525 2525 2525 2525 2525 2525 2525 2525 2525 2525 2525
2466640  2525 2525 2525 2525 2525 2525 2525 2525 2525 2525 2525 2525 2525 2525 2525 2525 0a25 2525 250a 2525 2525 2046 7265 6520
2466720  616e 6420 6465 7065 6e64 616e 7420 6f70 6572 6174 6f72 7320 696e 2061 2070 726f 6362 6f64 790a 2525 2525 0a0a 2525 204f
2467000  7020 6973 2061 2066 7265 6520 6f70 6572 6174 6f72 2069 6620 7468 6572 6520 6973 206e 6f20 6f74 6865 7220 6f70 6572 6174
2467060  6f72 2069 6e20 7468 6520 666c 6f77 2067 7261 7068 0a25 2520 7468 6174 2070 7265 6365 6465 7320 6974 2e09 0a0a 6672 6565
2467140  5f6f 7065 7261 746f 7228 4f70 2920 3a2d 0a09 6578 6973 7473 5f6f 7065 7261 746f 7228 4f70 292c 0a09 5c2b 2070 7265 6365
2467220  6465 7328 5f2c 204f 7029 2e0a 0a66 7265 655f 6f70 6572 6174 6f72 7328 4c69 7374 2920 3a2d 0a09 6669 6e64 616c 6c28 4f70
2467300  2c20 6672 6565 5f6f 7065 7261 746f 7228 4f70 292c 204c 6973 7429 2e0a 0a66 7265 655f 6f70 6572 6174 6f72 5f69 6473 284c
2467360  6973 7429 203a 2d0a 0966 696e 6461 6c6c 284f 7049 642c 2028 6672 6565 5f6f 7065 7261 746f 7228 4f70 292c 6f70 6572 6174
2467440  6f72 5f69 6428 4f70 2c4f 7049 6429 292c 204c 6973 7429 2e0a 0a25 2520 4f70 2069 7320 6120 6465 7065 6e64 656e 7420 6f70
2467520  6572 6174 6f72 2069 6620 7468 6572 6520 6578 6973 7473 2061 7420 6c65 6173 7420 6f6e 6520 6f70 6572 6174 6f72 0a25 2520
2467600  696e 2074 6865 2066 6c6f 7720 6772 6170 6820 7468 6174 2070 7265 6365 6465 7320 6974 2e09 4974 206d 616b 6573 2069 7420
2467660  6d6f 7265 2065 6666 6963 6965 6e74 0a25 2520 746f 2073 696d 706c 7920 6c6f 6f6b 2066 6f72 2061 6e20 6f70 6572 6174 6f72
2467740  2074 6861 7420 696d 6d65 6469 6174 656c 7920 7072 6563 6564 6573 204f 702c 0a25 2520 7468 6572 6562 7920 6c69 6d69 7469
2470020  6e67 2074 6865 2072 6570 6574 6974 696f 6e20 746f 2061 7420 6d6f 7374 2074 6865 206e 756d 6265 7220 6f66 2069 6e70 7574
2470100  730a 2525 206f 6620 7468 6520 6f70 6572 6174 6f72 204f 702e 090a 0a64 6570 656e 6461 6e74 5f6f 7065 7261 746f 7228 4f70
2470160  2920 3a2d 0a09 7072 6563 6564 6573 5f69 6d6d 6564 6961 7465 285f 2c20 4f70 292e 0a0a 2525 2053 6574 2069 7320 6120 7365
2470240  7420 6f66 206f 7065 7261 746f 7273 2074 6861 7420 6465 7065 6e64 206f 6e20 6f74 6865 7220 6f70 6572 6174 6f72 732e 200a
2470320  2525 2069 652e 2045 7665 7279 206f 7065 7261 746f 7220 696e 2074 6865 2073 6574 2068 6173 2061 6e20 6f70 6572 6174 6f72
2470400  2074 6861 7420 696d 6d65 6469 6174 656c 790a 2525 2070 7265 6365 6465 7320 6974 2e0a 0a64 6570 656e 6461 6e74 5f6f 7065
2470460  7261 746f 7273 2853 6574 2920 3a2d 0a09 6669 6e64 616c 6c28 4f70 2c20 6465 7065 6e64 616e 745f 6f70 6572 6174 6f72 284f
2470540  7029 2c20 4c69 7374 292c 0a09 6c69 7374 5f74 6f5f 7365 7428 4c69 7374 2c20 5365 7429 2e0a 0a25 2520 5365 7420 6973 2061
2470620  2073 6574 206f 6620 6964 2773 206f 6620 6f70 6572 6174 6f72 7320 7468 6174 2064 6570 656e 6420 6f6e 206f 7468 6572 206f
2470700  7065 7261 746f 7273 2e20 0a25 2520 6965 2e20 4576 6572 7920 6964 2069 6e20 7468 6520 7365 7420 636f 7272 6573 706f 6e64
2470760  7320 746f 2061 6e20 6f70 6572 6174 6f72 2074 6861 7420 6861 7320 616e 0a25 2520 6f70 6572 6174 6f72 2074 6861 7420 696d
2471040  6d65 6469 6174 656c 7920 7072 6563 6564 6573 2069 742e 0a0a 6465 7065 6e64 616e 745f 6f70 6572 6174 6f72 5f69 6473 2853
```

```
2471120 6574 2920 3a2d 0a09 6669 6e64 616c 6c28 4f70 4964 2c20 2864 6570 656e 6461 6e74 5f6f 7065 7261 746f 7228 4f70 292c 206f
2471200 7065 7261 746f 725f 6964 284f 702c 4f70 4964 2929 2c20 4c69 7374 292c 0a09 6c69 7374 5f74 6f5f 7365 7428 4c69 7374 2c20
2471260 5365 7429 2e0a 0a25 2525 2525 2525 2525 2525 2525 2525 2525 2525 2525 2525 2525 2525 2525 2525 2525 2525 2525 2525
2471340 2525 2525 2525 2525 2525 2525 2525 2525 2525 2525 2525 2525 2525 2525 2525 2525 2525 2525 250a 6c69 7374 285b 5d2c 5f2c
2471420 5b5d 2920 3a2d 2021 2e0a 696f 5f63 6c75 7374 6572 5f69 6e70 7574 735f 6c69 7374 285b 494f 6e6f 6465 7c54 6169 6c5d 2c4f
2471500 7049 644c 6973 742c 5b49 647c 5265 7374 5d29 203a 2d0a 0969 6f6e 6f64 655f 7661 7269 6162 6c65 5f69 6428 494f 6e6f 6465
2471560 2c20 4964 292c 0909 2520 6765 7420 7661 7269 6162 6c65 2069 6420 6f66 2069 6f6e 6f64 650a 0969 735f 696f 6e6f 6465 2849
2471640 6429 2c20 212c 0909 0925 2069 7320 6974 2061 6e6f 7468 6572 2069 6f6e 6f64 653f 0a09 696f 6e6f 6465 5f70 6172 656e 746f
2471720 7028 4964 2c20 5061 7265 6e74 4f70 292c 0909 2520 6765 7420 6964 206f 6620 696f 6e6f 6465 2773 206f 7065 7261 746f 720a
2472000 095c 2b20 6d65 6362 6572 6368 6b28 5061 7265 6e74 4f70 2c20 4f70 4964 4c69 7374 292c 0925 2074 6869 7320 6f70 206e 6f74
2472060 2069 6e20 4f70 4964 4c69 7374 0a09 696f 5f63 6c75 7374 6572 5f69 6e70 7574 735f 6c69 7374 2854 6169 6c2c 4f70 4964 4c69
2472140 7374 2c52 6573 7429 2e0a 696f 5f63 6c75 7374 6572 5f69 6e70 7574 735f 6c69 7374 285b 5f49 4f6e 6f64 657c 5461 696c 5d2c
2472220 4f70 4964 4c69 7374 2c52 6573 7429 203a 2d0a 0969 6f5f 636c 7573 7465 725f 696e 7075 7473 5f6c 6973 7428 5461 696c 2c4f
2472300 7049 644c 6973 742c 5265 7374 292e 0a0a 2525 2525 2525 2525 2525 2525 2525 2525 2525 2525 2525 2525 2525 2525 2525
2472360 2525 2525 2525 2525 2525 2525 2525 2525 2525 2525 2525 2525 2525 2525 2525 2525 2525 2525 2525 2525 2525 2525 0a25
2472440 2520 5468 6520 666f 6c6c 6f77 696e 6720 636c 6175 7365 2063 6f75 6c64 2062 6520 6d65 7267 6564 2077 6974 6820 6f74 6865
2472520 7220 7265 6c61 7465 6420 636c 6175 7365 730a 2525 2074 6861 7420 6578 616d 696e 6520 696f 6e6f 6465 7320 6f66 206f 7065
2472600 7261 746f 7273 2e0a 0a25 2520 4765 7420 696e 7075 7420 696f 6e6f 6465 7320 6f66 2061 6e20 4f70 6572 6174 6f72 2061 6e64
2472660 2066 6f72 6d20 6120 6c69 7374 206f 6620 696e 7075 7420 5661 7269 6162 6c65 2049 6427 730a 2525 2028 776f 726b 7320 666f
2472740 7220 626f 7468 204f 7020 616e 6420 4f70 4964 292e 0a20 0a6f 7065 7261 746f 725f 696e 7075 745f 7661 7273 284f 702c 204c
2473020 6973 7429 203a 2d0a 096f 7065 7261 746f 7228 4f70 292c 0a09 6f70 6572 6174 6f72 5f69 6428 4f70 2c20 4f70 4964 292c 0a09
2473100 6f70 6572 6174 6f72 5f69 6e70 7574 5f76 6172 7328 4f70 4964 2c20 4c69 7374 292c 0a09 212e 0a6f 7065 7261 746f 725f 696e
2473160 7075 745f 7661 7273 284f 7049 642c 204c 6973 7429 203a 2d0a 0969 735f 6f70 6572 6174 6f72 284f 7049 6429 2c0a 0969 6f6e
2473240 6f64 655f 7061 7265 6e74 6f70 2849 4f6e 6f64 652c 204f 7049 6429 2c0a 0969 6f6e 6f64 655f 7479 7065 2849 4f6e 6f64 652c
2473320 2069 6e70 7574 292c 0a09 6669 6e64 616c 6c28 494f 6e6f 6465 2c20 6765 7464 6228 494f 6e6f 6465 292c 2049 4f6e 6f64 654c
2473400 6973 7429 2c0a 096f 7065 7261 746f 725f 696e 7075 745f 7661 7273 5f61 7578 2849 4f6e 6f64 654c 6973 742c 204c 6973 7429
2473460 2e0a 0a25 2520 4175 7869 6c69 6172 7920 7072 6564 6963 6174 6520 666f 7220 6f70 6572 6174 6f72 5f69 6e70 7574 5f76 6172
2473540 733b 0a25 2520 4966 2076 6172 6961 626c 655f 6964 206f 6620 494f 6e6f 6465 2069 7320 6120 7661 7269 6162 6c65 2f63 6f6e
2473620 7374 616e 7420 7468 656e 2072 6574 6169 6e20 6974 2c0a 2525 2049 6620 6974 2069 7320 616e 2069 6f6e 6f64 652c 2068 6f77
2473700 6576 6572 2c20 7468 656e 2074 6865 2049 6420 6973 2074 6865 2076 6172 6961 626c 655f 6964 206f 660a 2525 2074 6869 7320
2473760 696f 6e6f 6465 2e0a 0a6f 7065 7261 746f 725f 696e 7075 745f 7661 7273 5f61 7578 285b 5d2c 205b 5d29 203a 2d20 212e 0a6f
2474040 7065 7261 746f 725f 696e 7075 745f 7661 7273 5f61 7578 285b 494f 6e6f 6465 7c54 6169 6c5d 2c20 5b56 6172 4964 7c52 6573
2474120 745d 2920 3a2d 0a09 696f 5e6f 6465 5f76 6172 6961 626c 655f 6964 2849 4f6e 6f64 652c 2056 6172 4964 292c 0a09 6973 5f76
2474200 6172 6961 626c 6528 5661 7249 6429 2c0a 096f 7065 7261 746f 725f 696e 7075 745f 7661 7273 5f61 7578 2854 6169 6c2c 2052
2474260 6573 7429 2e0a 6f70 6572 6174 6f72 5f69 6e70 7574 5f76 6172 735f 6175 7828 5b49 4f6e 6f64 657c 5461 696c 5d2c 205b 5661
2474340 7249 647c 5265 7374 5d29 203a 2d0a 0969 6f6e 6f64 655f 7661 7269 6162 6c65 5f69 6428 494f 6e6f 6465 2c20 4964 292c 0a09
2474420 6973 5f69 6f6e 6f64 6528 4964 292c 0a09 696f 6e6f 6465 5f69 6428 4e6f 6465 2c20 4964 292c 0a09 6765 7464 6228 4e6f 6465
2474500 292c 0a09 696f 6e6f 6465 5f76 6172 6961 626c 655f 6964 284e 6f64 652c 2056 6172 4964 292c 0a09 6f70 6572 6174 6f72 5f69
2474560 6e70 7574 5f76 6172 735f 6175 7828 5461 696c 2c20 5265 7374 292e 0a0a 2525 2047 6574 206f 7574 7075 7420 696f 6e6f 6465
2474640 7320 6f66 204f 7020 616e 6420 666f 726d 2061 206c 6973 7420 6f66 206f 7574 7075 7420 7661 7220 4964 2773 0a25 2520 2857
2474720 6f72 6b73 2066 6f72 2062 6f74 6820 4f70 2061 6e64 204f 7049 6429 0a0a 6f70 6572 6174 6f72 5f6f 7574 7075 745f 7661 7273
2475000 284f 702c 204c 6973 7429 203a 2d0a 096f 7065 7261 746f 7228 4f70 292c 0a09 6f70 6572 6174 6f72 5f69 6428 4f70 2c20 4f70
2475060 4964 292c 0a09 6f70 6572 6174 6f72 5f6f 7574 7075 745f 7661 7273 284f 7049 642c 204c 6973 7429 2c0a 0921 2e0a 6f70 6572
2475140 6174 6f72 5f6f 7574 7075 745f 7661 7273 284f 7049 642c 204c 6973 7429 203a 2d0a 0969 735f 6f70 6572 6174 6f72 284f 7049
2475220 6429 2c0a 0969 6f6e 6f64 655f 7061 7265 6e74 6f70 2849 4f6e 6f64 652c 204f 7049 6429 2c0a 0969 6f6e 6f64 655f 7479 7065
2475300 2849 4f6e 6f64 652c 206f 7574 7075 7429 2c0a 0966 696e 6461 6c6c 2849 4f6e 6f64 652c 2067 6574 6462 2849 4f6e 6f64 6529
2475360 2c20 494f 6e6f 6465 4c69 7374 292c 0a09 6f70 6572 6174 6f72 5f6f 7574 7075 745f 7661 7273 5f61 7578 2849 4f6e 6f64 654c
2475440 6973 742c 204c 6973 7429 2e0a 0a25 2520 5265 7461 696e 2074 6865 2076 6172 6961 626c 655f 6964 206f 6620 494f 6e6f 6465
2475520 2077 6865 7468 6572 2069 7427 7320 6120 7661 7269 6162 6c65 206f 7220 616e 0a25 2520 696e 7465 726d 6564 6961 7465 206f
2475600 7574 7075 742e 0a0a 6f70 6572 6174 6f72 5f6f 7574 7075 745f 7661 7273 5f61 7578 285b 5d2c 205b 5d29 203a 2d20 212e 0a6f
2475660 7065 7261 746f 725f 6f75 7470 7574 5f76 6172 735f 6175 7828 5b49 4f6e 6f64 657c 5461 696c 5d2c 205b 5661 7249 647c 5265
2475740 7374 5d29 203a 2d0a 0969 6f6e 6f64 655f 7661 7269 6162 6c65 5f69 6428 494f 6e6f 6465 2c20 5661 7249 6429 2c0a 096f 7065
2476020 7261 746f 725f 6f75 7470 7574 5f76 6172 735f 6175 7828 5461 696c 2c20 5265 7374 292e 0a0a 2525 2525 2525 2525 2525 2525
2476100 2525 2525 2525 2525 2525 2525 2525 2525 2525 2525 2525 2525 2525 2525 2525 2525 2525 2525 2525 2525 2525 2525 2525
2476160 2525 2525 2525 2525 2525 2525 2525 2525 2525 0a25 2525 250a 2525 2525 2045 7861 6d69 6e65 2069 6e70 7574 2061 6e64 206f
```

```
2476240 7574 7075 7420 696f 6e6f 6465 7320 616e 6420 696f 6e6f 6465 2069 6427 730a 2525 2525 0a0a 2525 2047 6574 2061 204c 6973
2476320 7420 6f66 2061 6c6c 2069 6f6e 6f64 6573 206f 6620 7479 7065 2049 4f54 7970 6520 696e 2050 726f 6342 6f64 792e 0a0a 696f
2476400 6e6f 6465 5f6c 6973 7428 5072 6f63 425f 6479 4964 2c20 494f 5479 7065 2c20 4c69 7374 2920 3a2d 0a09 696f 6e6f 6465 5f6c
2476460 6973 7428 5f4f 7049 642c 2050 726f 6342 6f64 7949 642c 2049 4f54 7970 652c 204c 6973 7429 2e0a 0a25 2520 4765 7420 6120
2476540 4c69 7374 206f 6620 616c 6c20 696f 6e6f 6465 7320 6f66 2074 7970 6520 494f 5479 7065 2062 656c 6f6e 6769 6e67 2074 6f20
2476620 6f70 6572 6174 6f72 0a25 2520 7769 7468 2069 6420 4f70 4964 2069 6e20 5072 6f63 426f 6479 2e0a 0a69 6f6e 6f64 655f 6c69
2476700 7374 284f 7049 642c 2050 726f 6342 6f64 7949 642c 2049 4f54 7970 652c 204c 6973 7429 203a 2d0a 0969 6f6e 6f64 655f 7061
2476760 7265 6e74 6f70 2849 4f6e 6f64 652c 204f 7049 6429 2c0a 0969 6f6e 6f64 655f 7061 7265 6e74 7072 6f63 2849 4f6e 6f64 652c
2477040 2050 726f 6342 6f64 7949 6429 2c0a 0969 6f6e 6f64 655f 7479 7065 2849 4f6e 6f64 652c 2049 4f54 7970 6529 2c0a 0966 696e
2477120 6461 6c6c 2849 4f6e 6f64 652c 2067 6574 6462 2849 4f6e 6f64 6529 2c20 4c69 7374 292e 0a0a 2525 2047 6574 2061 204c 6973
2477200 7420 6f66 2069 6427 7320 6f66 2069 6f6e 6f64 6573 206f 6620 7479 7065 2049 4f54 7970 6520 696e 2050 726f 6342 6f64 792e
2477260 0a0a 696f 6e6f 6465 5f69 645f 6c69 7374 2850 726f 6342 6f64 7949 642c 2049 4f54 7970 652c 2049 644c 6973 7429 203a 2d0a
2477340 0969 6f6e 6f64 655f 6964 5f6c 6973 7428 5f4f 7049 642c 2050 726f 6342 6f64 7949 642c 2049 4f54 7970 652c 2049 644c 6973
2477420 7429 2e0a 0a25 2520 4765 7420 6120 4c69 7374 206f 6620 6964 2773 206f 6620 696f 6e6f 6465 7320 6f66 2074 7970 6520 494f
2477500 5479 7065 2062 656c 6f6e 6769 6e67 2074 6f0a 2525 206f 7065 7261 746f 7220 7769 7468 2069 6420 4f70 4964 2069 6e20 5072
2477560 6f63 426f 6479 2e0a 0a69 6f6e 6f64 655f 6964 5f6c 6973 7428 4f70 4964 2c20 5072 6f63 426f 6479 4964 2c20 494f 5479 7065
2477640 2c20 4964 4c69 7374 2920 3a2d 0a09 696f 6e6f 6465 5f70 6172 656e 746f 702d 494f 6e6f 6465 2c20 4f70 4964 292c 0a09 696f
2477720 6e6f 6465 5f70 6172 656e 7470 726f 6328 494f 6e6f 6465 2c20 5072 6f63 426f 6479 4964 292c 0a09 696f 6e6f 6465 5f74 7970
2500000 6528 494f 6e6f 6465 2c20 494f 5479 7065 292c 0a09 696f 6e6f 6465 5f69 6428 494f 6e6f 6465 2c20 494f 6e6f 6465 4964 292c
2500060 0a09 6669 6e64 616c 6c28 494f 6e6f 6465 4964 2c20 6765 7464 6228 494f 6e6f 6465 292c 2049 644c 6973 7429 2e0a 0a25 2525
2500140 2525 2525 2525 2525 2525 2525 2525 2525 2525 2525 2525 2525 2525 2525 2525 2525 2525 2525 2525 2525 2525 2525 2525 2525
2500220 2525 2525 2525 2525 2525 2525 2525 2525 2525 2525 2525 2525 2525 250a 2525 2525 0a25 2525 2520 4578 616d 696e 6520 696e
2500300 7075 7420 616e 6420 6f75 7470 7574 2076 6172 6961 626c 6573 206f 7220 636f 6e73 7461 6e74 7320 6f66 2061 2050 726f 6342
2500360 6f64 790a 2525 2525 0a0a 2525 2047 6574 7320 616c 6c20 7468 6520 7661 7269 6162 6c65 7320 6f72 2063 6f6e 7374 616e 7473
2500440 2069 6e20 6462 2074 6861 7420 6172 6520 6569 7468 6572 2069 6e70 7574 7320 6f72 0a25 2520 6f75 7470 7574 732e 2052 656d
2500520 6f76 6573 2064 7570 6c69 6361 7465 7321 0a0a 696f 5f6c 6973 7428 494f 5479 7065 2c20 4964 7329 203a 2d0a 0969 6f5f 6c69
2500600 7374 285f 5072 6f63 426f 6479 4964 2c20 494f 5479 7065 2c20 4964 7329 2e0a 0a25 2520 4765 7473 2074 6865 2076 6172 6961
2500660 526c 6573 206f 7220 636f 6e73 7461 6e74 7320 7468 6174 2061 7265 2065 6974 6865 7220 696e 7075 7473 206f 720a 2525 206f
2500740 7574 7075 7473 206f 6620 7468 6520 7072 6f63 626f 6479 2e20 5265 6d6f 7665 7320 6475 706c 6963 6174 6573 210a 2525 2054
2501020 6869 7320 6973 206f 6b61 7920 696e 2074 6865 2063 6173 6520 6f66 206f 7574 7075 7473 2c20 6966 2077 6861 7420 796f 7520
2501100 7761 6e74 2069 7320 6f6e 6c79 2074 6865 0a25 2520 7468 6520 6e61 6d65 7320 616e 6420 6964 2773 206f 6620 7468 6520 7661
2501160 7269 6162 6c65 7320 7468 6174 2061 7265 2063 6861 6e67 6564 2069 6e20 7468 6520 7072 6f63 626f 6479 2e0a 2525 2049 6620
2501240 796f 7520 6172 6520 696e 7465 7265 7374 6564 2069 6e20 6669 6e64 696e 6720 6f75 7420 7768 6363 6820 7761 7320 7468 6520
2501320 6c61 7374 206f 7065 7261 746f 7220 7468 6174 0a25 2520 6368 616e 6765 6420 7468 6520 7661 7269 6162 6c65 2074 6865 6e20
2501400 7573 6520 7468 6520 7072 6564 6963 6174 6520 2269 6f5f 6c69 7374 5f76 6172 7322 2069 6e73 7465 6164 0a25 250a 2525 2057
2501460 6564 2041 7567 2032 3320 3130 3a32 373a 3130 2031 3938 3920 2d2d 2056 696a 6179 204e 6167 6173 616d 790a 0a69 6f5f 6c69
2501540 7374 2850 726f 6342 6f64 7949 642c 2049 4f54 7970 652c 2049 6473 2920 3a2d 0a09 696f 6e6f 6465 5f6c 6973 7428 5072 6f63
2501620 426f 6479 4964 2c20 494f 5479 7065 2c20 494f 6e6f 6465 4c69 7374 292c 2025 2067 6574 2069 6f6e 6f64 6573 0a09 696f 5f6c
2501700 6973 745f 6175 7828 494f 6e6f 6465 4c69 7374 2c20 4964 4c69 7374 292c 2025 206c 6f6f 6b20 666f 7220 7661 7269 6162 6c65
2501760 732f 636f 6e73 7473 0a09 6c69 7374 5f74 6f5f 6f72 645f 7365 7428 4964 4c69 7374 2c20 4964 7329 2e09 0925 2072 656d 6f76
2502040 6520 6475 706c 6963 6174 6573 0a0a 696f 5f6c 6973 745f 6175 7828 5b5d 2c20 5b5d 2920 3a2d 2021 2e0a 696f 5f6c 6973 745f
2502120 6175 7828 5b49 4f6e 6f64 657c 5461 696c 5d2c 205b 4964 7c52 6573 745d 2920 3a2d 0a09 696f 6e6f 6465 5f76 6172 6961 626c
2502200 655f 6964 2849 4f6e 6f64 652c 2049 6429 2c0a 0928 6973 5f76 6172 6961 626c 6528 4964 2920 7c20 6973 5f63 6f6e 7374 616e
2502260 7428 4964 2929 2c0a 0921 2c0a 0969 6f5f 6c69 7374 5f61 7578 2854 6169 6c2c 2052 6573 7429 2e0a 696f 5f6c 6973 745f 6175
2502340 7828 5b5f 7c54 6169 6c5d 2c20 5265 7374 2920 3a2d 0a09 696f 5f6c 6973 745f 6175 7828 5461 696c 2c20 5265 7374 292e 0a0a
2502420 2525 2525 2525 2525 2525 2525 2525 2525 2525 2525 2525 2525 2525 2525 2525 2525 2525 2525 2525 2525 2525 2525 2525 2525
2502500 2525 2525 2525 2525 2525 2525 2525 2525 2525 2525 2525 2525 2525 2525 2525 0a25 2525 250a 2525 2525 2044 6174 6120 6465
2502560 7065 6e64 616e 6379 2061 6d6f 6e67 206f 7065 7261 746f 7273 0a25 2525 250a 0a25 2520 4f70 3120 616e 6420 4f70 3220 6861
2502640 7665 2061 2064 6174 6120 6465 7065 6e64 656e 6379 2069 6620 7468 6579 2062 656c 6f6e 6720 746f 2074 6865 2073 616d 650a
2502720 2525 2070 726f 6362 6f64 7920 616e 6420 6569 7468 6572 204f 7031 2068 6173 2074 6f20 7072 6563 6565 6420 4f70 3220 6f72
2503000 2076 6963 6520 7665 7273 6120 696e 2074 6865 0a25 2520 666c 6f77 2067 7261 7068 2e0a 0a64 6174 615f 6465 7065 6e64 656e
2503060 6379 284f 7031 2c4f 7032 2920 3a2d 0a09 280a 0920 2020 2070 7265 6365 6465 735f 696d 6d65 6469 6174 6528 4f70 312c 204f
2503140 7032 290a 093b 0a09 2020 2020 7072 6563 6564 6573 5f69 6d6d 6564 6961 7465 284f 7032 2c20 4f70 3129 0a09 292c 200a 0921
2503220 2e0a 2525 2041 6464 6564 2074 6869 7320 6669 7273 7420 636c 6175 7365 2066 6f72 2074 6865 2073 616b 6520 6f66 2065 6666
2503300 6963 6965 6e63 792e 2054 6865 2066 6f6c 6c6f 7769 6e67 0a25 2520 636c 6175 7365 2061 6c6f 6e65 2073 686f 756c 6420 6265
```

| | | | | | | | | | | | | | | | | | | | | | | | | |
|---|---|---|---|---|---|---|---|---|---|---|---|---|---|---|---|---|---|---|---|---|---|---|---|---|
| 2503360 | 2073 | 7566 | 6669 | 6369 | 656e | 7420 | 746f | 2068 | 616e | 646c | 6520 | 7468 | 6520 | 6465 | 6669 | 6e69 | 7469 | 6f6e | 206f | 6620 | 6461 | 7461 | 0a25 | 2520 |
| 2503440 | 6465 | 7065 | 6e64 | 616e | 6379 | 2e0a | 6461 | 7461 | 5f64 | 6570 | 656e | 6465 | 6e63 | 7928 | 4f70 | 312c | 4f70 | 3229 | 203a | 2d0a | 0928 | 0a09 | 2020 | 2020 |
| 2503520 | 7072 | 6563 | 6564 | 6573 | 284f | 7031 | 2c20 | 4f70 | 3229 | 0a09 | 3b0a | 0920 | 2020 | 2070 | 7265 | 6365 | 6465 | 7328 | 4f70 | 322c | 204f | 7031 | 290a | 0929 |
| 2503600 | 2e0a | 0a25 | 2520 | 4f70 | 3120 | 2269 | 616d | 6564 | 6961 | 7465 | 6c79 | 2070 | 7265 | 6365 | 6564 | 7322 | 204f | 7032 | 2069 | 6e20 | 7468 | 6520 | 666c | 6f77 |
| 2503660 | 2067 | 7261 | 7068 | 2069 | 6620 | 4f70 | 3120 | 616e | 6420 | 4f70 | 3220 | 6265 | 6c6f | 6e67 | 0a25 | 2520 | 746f | 2074 | 6865 | 2073 | 616d | 6520 | 7072 | 6f63 |
| 2503740 | 626f | 6479 | 2061 | 6e64 | 2074 | 6865 | 206f | 7574 | 7075 | 7420 | 6f66 | 204f | 7031 | 2069 | 7320 | 616e | 2069 | 6e70 | 7574 | 2074 | 6f20 | 4f70 | 322e | 0a0a |
| 2504020 | 7072 | 6563 | 6564 | 6573 | 5f69 | 6d6d | 6564 | 6961 | 7465 | 284f | 7031 | 2c20 | 4f70 | 3229 | 3a2d | 0a09 | 286e | 6f6e | 7661 | 7228 | 4f70 | 3129 | 203b | 2065 |
| 2504100 | 7869 | 7374 | 735f | 6f70 | 6572 | 6174 | 6f72 | 284f | 7031 | 2929 | 2c09 | 2520 | 6861 | 6e64 | 6c65 | 2075 | 6e69 | 6e73 | 7461 | 6e74 | 6961 | 7465 | 6420 | 4f70 |
| 2504160 | 310a | 0928 | 6e6f | 6e76 | 6172 | 284f | 7032 | 2920 | 3b20 | 6578 | 6973 | 7473 | 5f6f | 7065 | 7261 | 746f | 7228 | 4f70 | 3229 | 292c | 0925 | 2068 | 616e | 646c |
| 2504240 | 6520 | 756e | 696e | 7374 | 616e | 7469 | 6174 | 6564 | 204f | 7032 | 0a09 | 7361 | 6d65 | 5f70 | 726f | 6362 | 6f64 | 7928 | 4f70 | 312c | 204f | 7032 | 292c | 0a09 |
| 2504320 | 696e | 7075 | 745f | 6f66 | 284f | 7032 | 2c20 | 5661 | 7229 | 2c0a | 096f | 7574 | 7075 | 745f | 6f66 | 284f | 7031 | 2c20 | 5661 | 7229 | 2e0a | 0a25 | 2520 | 4f70 |
| 2504400 | 3120 | 7072 | 6563 | 6564 | 6573 | 204f | 7032 | 2069 | 663a | 0a25 | 2520 | 312e | 204f | 7031 | 2069 | 6d6d | 6564 | 6961 | 7465 | 6c79 | 000f | 8398 | 0200 | 4ef7 |
| 2504460 | 0000 | 3287 | 0000 | 0008 | 0011 | 63dc | 0011 | 63dc | 0041 | 0000 | 0000 | 0000 | 0011 | b760 | 0300 | 4eff | 0000 | 3287 | 0000 | 000c | 0011 | 63ac | 0011 | 63ac |
| 2504540 | 0041 | 0000 | 0000 | 0000 | 000f | 8b18 | 0200 | 4f07 | 0000 | 3287 | 0000 | 0008 | 0011 | 61ac | 0011 | 61ac | 0041 | 0000 | 0000 | 0000 | 0012 | 71f8 | 0300 | 4f07 |
| 2504620 | 0000 | 3287 | 0000 | 000c | 0011 | 6180 | 0011 | 6180 | 0041 | 0000 | 0000 | 0000 | 000f | 84b0 | 0300 | 4f0f | 0000 | 3287 | 0000 | 000c | 0011 | 6104 | 0011 | 6104 |
| 2504700 | 0041 | 0000 | 0000 | 0000 | 0012 | 7238 | 0200 | 4f0f | 0000 | 3287 | 0000 | 0008 | 0011 | 6088 | 0011 | 6088 | 0041 | 0000 | 0000 | 0000 | 000f | 84d0 | 0200 | 4f17 |
| 2504760 | 0000 | 3287 | 0000 | 0008 | 0011 | 6064 | 0011 | 6064 | 0041 | 0000 | 0000 | 0000 | 000f | 8ee4 | 0300 | 4f1f | 0000 | 3287 | 0000 | 000c | 0011 | 5f9c | 0011 | 5f9c |
| 2505040 | 0041 | 0000 | 0000 | 0000 | 000f | 8fb4 | 0200 | 4f27 | 0000 | 3287 | 0000 | 0008 | 0011 | 5f48 | 0011 | 5f48 | 0041 | 0000 | 0000 | 0000 | 000f | 932c | 0300 | 4f2f |
| 2505120 | 0000 | 3287 | 0000 | 000c | 0011 | 5b9c | 0011 | 5b9c | 0041 | 0000 | 0000 | 0000 | 0010 | 1dd0 | 0200 | 4eaf | 0000 | 3287 | 0000 | 0008 | 0011 | 59f0 | 0011 | 59f0 |
| 2505200 | 0041 | 0000 | 0000 | 0000 | 0012 | 72f8 | 0400 | 4eaf | 0000 | 3287 | 0000 | 0010 | 0011 | 5994 | 0011 | 5994 | 0041 | 0000 | 0000 | 0000 | 0012 | 79e8 | 2c78 | 0020 |
| 2505260 | 0002 | 438a | 35c8 | 43c0 | 0200 | 0daf | 4b8c | 0000 | 0000 | 3287 | 6b88 | 22bc | 0008 | b2fc | 2c78 | 0020 | 0002 | 438a | 35c8 | 43c0 | 0200 | 0daf | 4b8c | 0000 |
| 2505340 | 0000 | 3287 | 6b88 | 22bc | 0008 | b67c | 0010 | de44 | 0100 | 64cf | 0000 | 3287 | 0000 | 0004 | 0012 | 739c | 0012 | 739c | 0001 | 0069 | 0000 | 0000 | 2c78 | 0020 |
| 2505420 | 0002 | 438a | 35c8 | 43c0 | 0200 | 0daf | 4b8c | 0000 | 0000 | 3287 | 6b88 | 22bc | 0008 | db5c | 0011 | 18b4 | 0100 | 469f | 0000 | 3287 | 0000 | 0004 | 0011 | 5354 |
| 2505500 | 0011 | 5354 | 0001 | 0069 | 0000 | 0000 | 0010 | de74 | 0100 | 64d7 | 0000 | 3287 | 0000 | 0004 | 0012 | 741c | 0012 | 741c | 0001 | 0069 | 0000 | 0000 | 0012 | 3808 |
| 2505560 | 0100 | 5347 | 0000 | 3287 | 0000 | 0004 | 0012 | c478 | 0012 | c478 | 0001 | 006b | 0000 | 0000 | 2c78 | 0018 | 0002 | 438a | 45b8 | 39a4 | 0012 | 7444 | 0010 | 2340 |
| 2505640 | 0012 | 73cc | 0008 | eb0c | 0100 | 52b7 | 0000 | 3287 | 0000 | 0004 | 0012 | bb7c | 0012 | bb7c | 0001 | 006b | 0000 | 0000 | 0013 | 6578 | 6973 | 7473 | 5f61 | 7263 |
| 2505720 | 6869 | 7465 | 6374 | 7572 | 6500 | 0000 | 0010 | dea4 | 0100 | 64df | 0000 | 3287 | 0000 | 0004 | 0012 | 748c | 0012 | 748c | 0001 | 0069 | 0000 | 0000 | 2c78 | 0018 |
| 2506000 | 0002 | 438a | 45b8 | 39a4 | 0012 | 74b4 | 0010 | 2340 | 0012 | 73cc | 0008 | e9ec | 0100 | 5237 | 0000 | 3287 | 0000 | 0004 | 0012 | bd20 | 0012 | bd20 | 0001 | 006b |
| 2506060 | 0000 | 0000 | 000f | 6573 | 6973 | 7473 | 5f66 | 756e | 6374 | 696f | 6e00 | 0000 | 0010 | dee4 | 0100 | 64e7 | 0000 | 3287 | 0000 | 0004 | 0012 | 74f8 | 0012 | 74f8 |
| 2506140 | 0001 | 0069 | 0000 | 0000 | 2c78 | 0018 | 0002 | 438a | 45b8 | 39a4 | 0012 | 7520 | 0010 | 2340 | 0012 | 73cc | ffff | ffff | 0100 | 52c7 | 0000 | 3287 | 0000 | 0004 |
| 2506220 | 0012 | bf60 | 0012 | bf60 | 0001 | 006b | 0000 | 0000 | 0010 | 6578 | 6973 | 7473 | 5f70 | 726f | 6365 | 6475 | 7265 | 0000 | 0010 | df14 | 0100 | 64ef | 0000 | 3287 |
| 2506300 | 0000 | 0004 | 0012 | 7564 | 0012 | 7564 | 0001 | 0069 | 0000 | 0000 | 2c78 | 0018 | 0002 | 438a | 45b8 | 39a4 | 0012 | 758c | 0010 | 2340 | 0012 | 73cc | 0012 | 3788 |
| 2506360 | 0100 | 533f | 0000 | 3287 | 0000 | 0004 | 0012 | c160 | 0012 | c160 | 0001 | 006b | 0000 | 0000 | 000e | 6578 | 6973 | 7473 | 5f70 | 726f | 6365 | 7373 | 0000 | 0000 |
| 2506440 | 0010 | dfa4 | 0100 | 64f7 | 0000 | 3287 | 0000 | 0004 | 0012 | 75d0 | 0012 | 75d0 | 0001 | 0069 | 0000 | 0000 | 2c78 | 0018 | 0002 | 438a | 45b8 | 39a4 | 0012 | 740c |
| 2506520 | 0010 | 2340 | 0012 | 73cc | 0011 | 6578 | 6973 | 7473 | 5f73 | 7461 | 7465 | 626c | 6f63 | 6b00 | 0010 | e1a0 | 0100 | 64ff | 0000 | 3287 | 0000 | 0004 | 0012 | 761c |
| 2506600 | 0012 | 761c | 0001 | 0069 | 0000 | 0000 | 2c78 | 0018 | 0002 | 438a | 45b8 | 39a4 | 0012 | 7644 | 0010 | 2340 | 0012 | 73cc | 0011 | 3c34 | 0100 | 5ee7 | 0000 | 3287 |
| 2506660 | 0000 | 0004 | 0012 | c790 | 0012 | c790 | 0001 | 006b | 0000 | 0000 | 2c78 | 0018 | 0002 | 438a | 45b8 | 39a4 | 0012 | 0fa4 | 0010 | 2340 | 0012 | 73cc | 000f | 6578 |
| 2506740 | 6973 | 7473 | 5f6f | 7065 | 7261 | 746f | 7200 | 0000 | 0010 | e150 | 0100 | 6507 | 0000 | 3287 | 0000 | 0004 | 0012 | 76a0 | 0012 | 76a0 | 0001 | 0069 | 0000 | 0000 |
| 2507020 | 2c78 | 0018 | 0002 | 438a | 45b8 | 39a4 | 0012 | 1020 | 0010 | 2340 | 0012 | 73cc | 0010 | e170 | 0100 | 650f | 0000 | 3287 | 0000 | 0004 | 0012 | 76d8 | 0012 | 76d8 |
| 2507100 | 0001 | 0069 | 0000 | 0000 | 2c78 | 0019 | 0002 | 438a | 45b8 | 39a4 | 0012 | 3ea4 | 0010 | 2340 | 0012 | 73cc | 000f | 6578 | 6973 | 7473 | 5f76 | 6172 | 6961 | 626c |
| 2507160 | 6500 | 0000 | 0010 | e1e8 | 0100 | 6517 | 0000 | 3287 | 0000 | 0004 | 0012 | 7724 | 0012 | 7724 | 0001 | 0069 | 0000 | 0000 | 2c78 | 0018 | 0002 | 438a | 45b8 | 39a4 |
| 2507240 | 0012 | 424c | 0010 | 2340 | 0012 | 73cc | 0011 | 1ba8 | 0100 | 651f | 0000 | 3287 | 0000 | 0004 | 0012 | 775c | 0012 | 775c | 0001 | 0069 | 0000 | 0000 | 2c78 | 0018 |
| 2507320 | 0002 | 438a | 45b8 | 39a4 | 0012 | 4524 | 0010 | 2340 | 0012 | 73cc | 000f | 6578 | 6973 | 7473 | 5f63 | 6f6e | 7374 | 616e | 7400 | 0000 | 0010 | e300 | 0100 | 6527 |
| 2507400 | 0000 | 3287 | 0000 | 0004 | 0012 | 77a8 | 0012 | 77a8 | 0001 | 0069 | 0000 | 0000 | 2c78 | 0018 | 0002 | 438a | 45b8 | 39a4 | 0012 | 4970 | 0010 | 2340 | 0012 | 73cc |
| 2507460 | 000e | 7075 | 7464 | 625f | 6675 | 6e63 | 7469 | 6f6e | 0000 | 0000 | 0010 | e3cc | 0100 | 652f | 0000 | 3287 | 0000 | 0004 | 0011 | 4490 | 0011 | 4490 | 0001 | 0069 |
| 2507540 | 0000 | 0000 | 000f | 7075 | 7464 | 625f | 7072 | 6f63 | 6564 | 7572 | 6500 | 0000 | 0010 | e440 | 0100 | 6537 | 0000 | 3287 | 0000 | 0004 | 0011 | 4420 | 0011 | 4420 |
| 2507620 | 0001 | 0069 | 0000 | 0000 | 0011 | 7072 | 6f63 | 6573 | 735f | 6f70 | 6572 | 6174 | 6f72 | 7300 | 0011 | 1bc8 | 0200 | 653f | 0000 | 3287 | 0000 | 0008 | 0012 | c4fc |
| 2507700 | 0012 | c4fc | 0001 | 006b | 0000 | 0000 | ffff | ffff | 0200 | 6547 | 0000 | 3287 | 0000 | 0008 | 000b | 22c8 | 000b | 22c8 | 0001 | 0069 | 0000 | 0000 | 0010 | e5c0 |
| 2507760 | 0200 | 654f | 0000 | 3287 | 0000 | 0008 | 0012 | c6b8 | 0012 | c6b8 | 0001 | 006b | 0000 | 0000 | 0010 | 6f70 | 6572 | 6174 | 6f72 | 5f69 | 645f | 6c69 | 7374 | 0000 |
| 2510040 | 0014 | 7374 | 6174 | 6562 | 6c6f | 636b | 5f6f | 7065 | 7261 | 746f | 7273 | 0000 | 0008 | c68c | 0200 | 6557 | 0000 | 3287 | 0000 | 0008 | 000a | 2ebc | 000a | 2ebc |
| 2510120 | 0001 | 0069 | 0000 | 0000 | 0008 | c6cc | 0200 | 655f | 0000 | 3287 | 0000 | 0008 | 0012 | c9dc | 0012 | c9dc | 0001 | 006b | 0000 | 0000 | 2c78 | 001c | 0002 | 438a |
| 2510200 | 373c | 0018 | 36b8 | 3640 | 35c8 | 31f0 | 239c | 0000 | 0012 | 7934 | 0012 | 031c | 0500 | 6017 | 0000 | 3287 | 0000 | 0014 | 000b | 3a58 | 000b | 3a58 | 0001 | 0069 |
| 2510260 | 0000 | 0000 | ffff | ffff | 0100 | 6567 | 0000 | 3287 | 0000 | 0004 | 0012 | cb94 | 0012 | cb94 | 0001 | 006b | 0000 | 0000 | 0012 | 03a4 | 0200 | 602f | 0000 | 3287 |
| 2510340 | 0000 | 0008 | 000a | 19f0 | 000a | 18f0 | 0000 | 0000 | 0000 | 0000 | 0012 | 7924 | 0100 | 6017 | 0000 | 3287 | 0000 | 0004 | 0011 | 40c8 | 0011 | 40c8 | 0001 | 0069 |
| 2510420 | 0000 | 0000 | 0012 | 7072 | 6f63 | 626f | 6469 | 6573 | 5f61 | 6e64 | 5f69 | 6473 | 0000 | 0000 | 0010 | e818 | 0200 | 6577 | 0000 | 3287 | 0000 | 0008 | 0011 | 70c0 |

| | | | | | | | | | | | | | | | | | | | | | | | | |
|---|---|---|---|---|---|---|---|---|---|---|---|---|---|---|---|---|---|---|---|---|---|---|---|---|
| 2510500 | 0011 | 70c0 | 0001 | 0069 | 0000 | 0000 | 27f0 | 0014 | 000b | 3bd4 | 4e1c | 0000 | 0000 | 0007 | 54a8 | 228c | 0000 | 002c | 0012 | 9c2c | b27c | b66c | 0000 | 0be9 |
| 2510560 | 7fff | ffff | 0012 | 51e0 | 0200 | 0db5 | 0200 | 2f35 | 0000 | 6307 | 0000 | 035b | 0000 | 315f | 0000 | 002c | 0012 | a864 | b27c | b66c | 0000 | 0c39 | 7fff | ffff |
| 2510640 | 0012 | 520c | 0200 | 0db5 | 0200 | 224d | 0000 | 6307 | 0000 | 3287 | 0000 | 315f | 2c78 | 0014 | 0002 | 438a | 3600 | 3678 | 0018 | 22bc | 0012 | eb40 | 0012 | 7cf0 |
| 2510720 | 0000 | 0288 | b27c | b66c | 0000 | 0beb | 0000 | 0c38 | 000a | d16d | 0200 | 0db5 | 0200 | 270d | 0000 | 6307 | 0000 | 3287 | 0000 | 315f | 0012 | 7ac4 | 0000 | 0038 |
| 2511000 | b27c | b66c | 0000 | 0bec | 0000 | 0c3a | 0012 | 7af4 | 0200 | 0db5 | 0500 | 1cdd | 0000 | 52b7 | 0000 | 000b | 0000 | 3287 | 0093 | a223 | 0000 | 035b | 0000 | 315f |
| 2511060 | 0012 | 7af0 | 0000 | 002c | b4f0 | b4e4 | 0000 | 0beb | 7fff | ffff | 0008 | b0dd | 0000 | 0000 | 0000 | 0000 | 0012 | 8ee4 | 0002 | 438a | 000e | 8670 | 0012 | 7b28 |
| 2511140 | 0000 | 0038 | b27c | b66c | 0000 | 0bed | 0000 | 0c3b | 0012 | 7b2c | 0200 | 0db5 | 0500 | 1cdd | 0000 | 6767 | 0000 | 0013 | 0000 | 3287 | 0095 | dd63 | 0000 | 035b |
| 2511220 | 0000 | 315f | 0012 | 7b60 | 0000 | 0038 | b27c | b66c | 0000 | 0bee | 0000 | 0c3c | 0012 | 7b64 | 0200 | 0db5 | 0500 | 1cdd | 0000 | 676f | 0000 | 0013 | 0000 | 3287 |
| 2511300 | 0095 | de63 | 0000 | 035b | 0000 | 315f | 0012 | 7b98 | 0000 | 0038 | b27c | b66c | 0000 | 0bef | 0000 | 0c3d | 0012 | 7b9c | 0200 | 0db5 | 0500 | 1cdd | 0000 | 6777 |
| 2511360 | 0000 | 0013 | 0000 | 3287 | 0095 | df63 | 0000 | 035b | 0000 | 315f | 0012 | 7bd0 | 0000 | 0038 | b27c | b66c | 0000 | 0bf0 | 0000 | 0c3e | 0012 | 7bd4 | 0200 | 0db5 |
| 2511440 | 0500 | 1cdd | 0000 | 677f | 0000 | 0013 | 0000 | 3287 | 0095 | e063 | 0000 | 035b | 0000 | 315f | 0012 | 7c08 | 0000 | 0038 | b27c | b66c | 0000 | 0bf1 | 0000 | 0c3f |
| 2511520 | 0012 | 7c0c | 0200 | 0db5 | 0500 | 1cdd | 0000 | 6787 | 0000 | 0013 | 0000 | 3287 | 0095 | e263 | 0000 | 035b | 0000 | 315f | 0012 | 7c40 | 0000 | 0038 | b27c | b66c |
| 2511600 | 0000 | 0bf2 | 0000 | 0c40 | 0012 | 7c44 | 0200 | 0db5 | 0500 | 1cdd | 0000 | 678f | 0000 | 0013 | 0000 | 3287 | 0095 | e363 | 0000 | 035b | 0000 | 315f | 0012 | 7c78 |
| 2511660 | 0000 | 0038 | b27c | b66c | 0000 | 0bf3 | 0000 | 0c41 | 0012 | 7c7c | 0200 | 0db5 | 0500 | 1cdd | 0000 | 6797 | 0000 | 0013 | 0000 | 3287 | 0095 | e463 | 0000 | 035b |
| 2511740 | 0000 | 315f | 0012 | 7cb0 | 0000 | 0038 | b27c | b66c | 0000 | 0bf4 | 0000 | 0c42 | 0012 | 7cf4 | 0200 | 0db5 | 0500 | 1cdd | 0000 | 679f | 0000 | 0013 | 0000 | 3287 |
| 2512020 | 0095 | e603 | 0000 | 035b | 0000 | 315f | 0012 | 7cf0 | 0000 | 0038 | b27c | b66c | 0000 | 0bfd | 0000 | 0c4b | 0012 | 7f34 | 0200 | 0db5 | 0500 | 1cdd | 0000 | 67df |
| 2512100 | 0000 | 0013 | 0000 | 3287 | 0095 | f2e3 | 0000 | 035b | 0000 | 315f | 0012 | cb64 | 000b | 1984 | 0012 | 7f30 | 0000 | 0230 | b27c | b66c | 0000 | 0bf5 | 0000 | 0c43 |
| 2512160 | 0012 | 7d2c | 0200 | 0db5 | 0500 | 1cdd | 0000 | 67a7 | 0000 | 0013 | 0000 | 3287 | 0095 | e163 | 0000 | 035b | 0000 | 315f | 0012 | 7d60 | 0000 | 0038 | b27c | b66c |
| 2512240 | 0000 | 0bf6 | 0000 | 0c44 | 0012 | 7d64 | 0200 | 0db5 | 0500 | 1cdd | 0000 | 67af | 0000 | 0013 | 0000 | 3287 | 0095 | e883 | 0000 | 035b | 0000 | 315f | 0012 | 7d98 |
| 2512320 | 0000 | 0038 | b27c | b66c | 0000 | 0bf7 | 0000 | 0c45 | 0012 | 7d9c | 0200 | 0db5 | 0500 | 1cdd | 0000 | 5237 | 0000 | 000b | 0000 | 3287 | 0093 | a5a3 | 0000 | 035b |
| 2512400 | 0000 | 315f | 0012 | 7dd0 | 0000 | 0038 | b27c | b66c | 0000 | 0bf8 | 0000 | 0c46 | 0012 | 7dd4 | 0200 | 0db5 | 0500 | 1cdd | 0000 | 67b7 | 0000 | 0013 | 0000 | 3287 |
| 2512460 | 0095 | ea83 | 0000 | 035b | 0000 | 315f | 0012 | 7e08 | 0000 | 0038 | b27c | b66c | 0000 | 0bf9 | 0000 | 0c47 | 0012 | 7e0c | 0200 | 0db5 | 0500 | 1cdd | 0000 | 67bf |
| 2512540 | 0000 | 0013 | 0000 | 3287 | 0095 | ec23 | 0000 | 035b | 0000 | 315f | 0012 | 7e40 | 0000 | 0038 | b27c | b66c | 0000 | 0bfa | 0000 | 0c48 | 0012 | 7e44 | 0200 | 0db5 |
| 2512620 | 0500 | 1cdd | 0000 | 67c7 | 0000 | 0013 | 0000 | 3287 | 0095 | edc3 | 0000 | 035b | 0000 | 315f | 0012 | 7e78 | 0000 | 0038 | b27c | b66c | 0000 | 0bfb | 0000 | 0c49 |
| 2512700 | 0012 | 7e7c | 0200 | 0db5 | 0500 | 1cdd | 0000 | 67cf | 0000 | 0013 | 0000 | 3287 | 0095 | ef83 | 0000 | 035b | 0000 | 315f | 0012 | 7eb0 | 0000 | 0038 | b27c | b66c |
| 2512760 | 0000 | 0bfc | 0000 | 0c4a | 0012 | 7cb4 | 0200 | 0db5 | 0500 | 1cdd | 0000 | 67d7 | 0000 | 0013 | 0000 | 3287 | 0095 | f123 | 0000 | 035b | 0000 | 315f | 0012 | 7ee8 |
| 2513040 | 0000 | 0038 | b27c | b66c | 0000 | 0c0d | 0000 | 0c5b | 0012 | 7eec | 0200 | 0db5 | 0500 | 1cdd | 0000 | 533f | 0000 | 000b | 0000 | 3287 | 0093 | ac63 | 0000 | 035b |
| 2513120 | 0000 | 315f | 0012 | 7f30 | 0000 | 0038 | b27c | b66c | 0000 | 0c0e | 0000 | 0c5c | 0012 | 837c | 0200 | 0db5 | 0500 | 1cdd | 0000 | 6857 | 0000 | 0013 | 0000 | 3287 |
| 2513200 | 0096 | cd23 | 0000 | 035b | 0000 | 315f | 0000 | 6a4f | b328 | 3618 | 0012 | a99c | 0000 | 0000 | 0012 | 8378 | 0000 | 03f0 | b27c | b66c | 0000 | 0bfe | 0000 | 0c4c |
| 2513260 | 0012 | 7f6c | 0200 | 0db5 | 0500 | 1cdd | 0000 | 67e7 | 0000 | 0013 | 0000 | 3287 | 0095 | f4a3 | 0000 | 035b | 0000 | 315f | 0012 | 7fa0 | 0000 | 0038 | b27c | b66c |
| 2513340 | 0000 | 0bff | 0000 | 0c4d | 0012 | 7fa4 | 0200 | 0db5 | 0500 | 1cdd | 0000 | 67ef | 0000 | 0013 | 0000 | 3287 | 0095 | f683 | 0000 | 035b | 0000 | 315f | 0012 | 7fd8 |
| 2513420 | 0000 | 0038 | b27c | b66c | 0000 | 0c00 | 0000 | 0c4e | 0012 | 7fdc | 0200 | 0db5 | 0500 | 1cdd | 0000 | 67f7 | 0000 | 0013 | 0000 | 3287 | 0095 | f863 | 0000 | 035b |
| 2513500 | 0000 | 315f | 0012 | 8010 | 0000 | 0038 | b27c | b66c | 0000 | 0c01 | 0000 | 0c4f | 0012 | 8014 | 0200 | 0db5 | 0500 | 1cdd | 0000 | 67ff | 0000 | 0013 | 0000 | 3287 |
| 2513560 | 0095 | fa83 | 0000 | 035b | 0000 | 315f | 0012 | 8048 | 0000 | 0038 | b27c | b66c | 0000 | 0c02 | 0000 | 0c50 | 0012 | 804c | 0200 | 0db5 | 0500 | 1cdd | 0000 | 52c7 |
| 2513640 | 0000 | 000b | 0000 | 3287 | 0093 | a903 | 0000 | 035b | 0000 | 315f | 0012 | 8080 | 0000 | 0038 | b27c | b66c | 0000 | 0c03 | 0000 | 0c51 | 0012 | 8084 | 0200 | 0db5 |
| 2513720 | 0500 | 1cdd | 0000 | 6807 | 0000 | 0013 | 0000 | 3287 | 0095 | fd23 | 0000 | 035b | 0000 | 315f | 0012 | 80b8 | 0000 | 0038 | b27c | b66c | 0000 | 0c04 | 0000 | 0c52 |
| 2514000 | 0012 | 80bc | 0200 | 0db5 | 0500 | 1cdd | 0000 | 680f | 0000 | 0013 | 0000 | 3287 | 0095 | fe23 | 0000 | 035b | 0000 | 315f | 0012 | 80f0 | 0000 | 0038 | b27c | b66c |
| 2514060 | 0000 | 0c05 | 0000 | 0c53 | 0012 | 80f4 | 0200 | 0db5 | 0500 | 1cdd | 0000 | 6817 | 0000 | 0013 | 0000 | 3287 | 0095 | ff23 | 0000 | 035b | 0000 | 315f | 0012 | 8128 |
| 2514140 | 0000 | 0038 | b27c | b66c | 0000 | 0c06 | 0000 | 0c54 | 0012 | 812c | 0200 | 0db5 | 0500 | 1cdd | 0000 | 681f | 0000 | 0013 | 0000 | 3287 | 0096 | 00c3 | 0000 | 035b |
| 2514220 | 0000 | 315f | 0012 | 8160 | 0000 | 0038 | b27c | b66c | 0000 | 0c07 | 0000 | 0c55 | 0012 | 8164 | 0200 | 0db5 | 0500 | 1cdd | 0000 | 6827 | 0000 | 0013 | 0000 | 3287 |
| 2514300 | 0096 | 01c3 | 0000 | 035b | 0000 | 315f | 0012 | 8198 | 0000 | 0038 | b27c | b66c | 0000 | 0c08 | 0000 | 0c56 | 0012 | 819c | 0200 | 0db5 | 0500 | 1cdd | 0000 | 682f |
| 2514360 | 0000 | 0013 | 0000 | 3287 | 0096 | 0363 | 0000 | 035b | 0000 | 315f | 0012 | 81d0 | 0000 | 0038 | b27c | b66c | 0000 | 0c09 | 0000 | 0c57 | 0012 | 81d4 | 0200 | 0db5 |
| 2514440 | 0500 | 1cdd | 0000 | 6837 | 0000 | 0013 | 0000 | 3287 | 0096 | 0503 | 0000 | 035b | 0000 | 315f | 0012 | 8208 | 0000 | 0038 | b27c | b66c | 0000 | 0c0a | 0000 | 0c58 |
| 2514520 | 0012 | 820c | 0200 | 0db5 | 0500 | 1cdd | 0000 | 683f | 0000 | 0013 | 0000 | 3287 | 0096 | 06c3 | 0000 | 035b | 0000 | 315f | 0012 | 8240 | 0000 | 0038 | b27c | b66c |
| 2514600 | 0000 | 0c0b | 0000 | 0c59 | 0012 | 8244 | 0200 | 0db5 | 0500 | 1cdd | 0000 | 6847 | 0000 | 0013 | 0000 | 3287 | 0096 | 0883 | 0000 | 035b | 0000 | 315f | 0012 | 8278 |
| 2514660 | 0000 | 0038 | b27c | b66c | 0000 | 0c0c | 0000 | 0c5a | 0012 | 7eb4 | 0200 | 0db5 | 0500 | 1cdd | 0000 | 684f | 0000 | 0013 | 0000 | 3287 | 0096 | 0a83 | 0000 | 035b |
| 2514740 | 0000 | 315f | 0012 | 82b0 | 0000 | 0038 | b27c | b66c | 0000 | 0c2d | 0000 | 0c7b | 0012 | 82b4 | 0200 | 0db5 | 0500 | 1cdd | 0000 | 691f | 0000 | 0013 | 0000 | 3287 |
| 2515020 | 0096 | 53a3 | 0000 | 035b | 0000 | 315f | 0012 | 82e8 | 0000 | 0038 | b27c | b66c | 0000 | 0c2e | 0000 | 0c7c | 0012 | 82ec | 0200 | 0db5 | 0500 | 1cdd | 0000 | 65af |
| 2515100 | 0000 | 000b | 0000 | 3287 | 005a | d4e3 | 0000 | 035b | 0000 | 315f | 0012 | 8378 | 0000 | 0038 | b27c | b66c | 0000 | 0c2f | 0000 | 0c7d | 0012 | 8c0c | 0200 | 0db5 |
| 2515160 | 0500 | 1cdd | 0000 | 5f7f | 0000 | 0013 | 0000 | 3287 | 008f | fc03 | 0000 | 035b | 0000 | 315f | 2c78 | 004c | 0002 | 438a | 45b8 | 46ec | 3b4c | 0000 | 0012 | 7444 |
| 2515240 | 0018 | 3348 | 4300 | 0000 | 0000 | 52b7 | 0011 | be4c | 0018 | 3d3c | 3b4c | 0000 | 0012 | bbac | 0014 | 37f0 | 3b4c | 0000 | 0012 | bc4c | 0010 | 41e8 | 0000 | 6927 |
| 2515320 | 2420 | 000c | 0012 | bc0c | b464 | 4d24 | 0013 | f070 | 000d | 4120 | 0012 | 8c90 | 0000 | 08c8 | b27c | b66c | 0000 | 0c0f | 0000 | 0c5d | 0012 | 83b4 | 0200 | 0db5 |
| 2515400 | 0500 | 1cdd | 0000 | 695f | 0000 | 0013 | 0000 | 3287 | 0096 | 0e23 | 0000 | 035b | 0000 | 315f | 0012 | 83e8 | 0000 | 0038 | b27c | b66c | 0000 | 0c10 | 0000 | 0c5e |
| 2515460 | 0012 | 83ec | 0200 | 0db5 | 0500 | 1cdd | 0000 | 6867 | 0000 | 0013 | 0000 | 3287 | 0096 | 0fc3 | 0000 | 035b | 0000 | 315f | 0012 | 8420 | 0000 | 0038 | b27c | b66c |
| 2515540 | 0000 | 0c11 | 0000 | 0c5f | 0012 | 8424 | 0200 | 0db5 | 0500 | 1cdd | 0000 | 686f | 0000 | 0013 | 0000 | 3287 | 0096 | 1163 | 0000 | 035b | 0000 | 315f | 0012 | 8458 |

```
2515620 0000 0038 b27c b66c 0000 0c12 0000 0c60 0012 845c 0200 0db5 0500 1cdd 0000 6877 0000 0013 0000 3287 0096 1403 0000 035b
2515700 0000 315f 0012 8490 0000 0038 b27c b66c 0000 0c13 0000 0c61 0012 8494 0200 0db5 0500 1cdd 0000 687f 0000 0013 0000 3287
2515760 0096 16a3 0000 035b 0000 315f 0012 84c8 0000 0038 b27c b66c 0000 0c14 0000 0c62 0012 84cc 0200 0db5 0500 1cdd 0000 6887
2516040 0000 0013 0000 3287 0096 1943 0000 035b 0000 315f 0012 8500 0000 0038 b27c b66c 0000 0c15 0000 0c63 0012 8504 0200 0db5
2516120 0500 1cdd 0000 688f 0000 0013 0000 3287 0096 1c03 0000 035b 0000 315f 0012 8538 0000 0038 b27c b66c 0000 0c16 0000 0c64
2516200 0012 853c 0200 0db5 0500 1cdd 0000 6897 0000 0013 0000 3287 0096 1ec3 0000 035b 0000 315f 0012 8570 0000 0038 b27c b66c
2516260 0000 0c17 0000 0c65 0012 8574 0200 0db5 0500 1cdd 0000 689f 0000 0013 0000 3287 0096 21c3 0000 035b 0000 315f 0012 85a8
2516340 0000 0038 b27c b66c 0000 0c18 0000 0c66 0012 85ac 0200 0db5 0500 1cdd 0000 5347 0000 000b 0000 3287 0093 a063 0000 035b
2516420 0000 315f 0012 85e0 0000 0038 b27c b66c 0000 0c19 0000 0c67 0012 85e4 0200 0db5 0500 1cdd 0000 68a7 0000 0013 0000 3287
2516500 0096 25e3 0000 035b 0000 315f 0012 8618 0000 0038 b27c b66c 0000 0c1a 0000 0c68 0012 861c 0200 0db5 0500 1cdd 0000 653f
2516560 0000 0013 0000 3287 0093 c263 0000 035b 0000 315f 0012 8650 0000 0038 b27c b66c 0000 0c1b 0000 0c69 0012 8654 0200 0db5
2516640 0500 1cdd 0000 68af 0000 0013 0000 3287 0096 2963 0000 035b 0000 315f 0012 8688 0000 0038 b27c b66c 0000 0c1c 0000 0c6a
2516720 0012 868c 0200 0db5 0500 1cdd 0000 68b7 0000 0013 0000 3287 0096 2c03 0000 035b 0000 315f 0012 86c0 0000 0038 b27c b66c
2517000 0000 0c1d 0000 0c6b 0012 86c4 0200 0db5 0500 1cdd 0000 68bf 0000 0013 0000 3287 0096 2e83 0000 035b 0000 315f 0012 86f8
2517060 0000 0038 b27c b66c 0000 0c1e 0000 0c6c 0012 86fc 0200 0db5 0500 1cdd 0000 68c7 0000 0013 0000 3287 0096 3123 0000 035b
2517140 0000 315f 0012 8730 0000 0038 b27c b66c 0000 0c1f 0000 0c6d 0012 8734 0200 0db5 0500 1cdd 0000 68cf 0000 0013 0000 3287
2517220 0096 33c3 0000 035b 0000 315f 0012 8768 0000 0038 b27c b66c 0000 0c20 0000 0c6e 0012 876c 0200 0db5 0500 1cdd 0000 654f
2517300 0000 0013 0000 3287 0093 c463 0000 035b 0000 315f 0012 87a0 0000 0038 b27c b66c 0000 0c21 0000 0c6f 0012 87a4 0200 0db5
2517360 0500 1cdd 0000 68d7 0000 0013 0000 3287 0096 3783 0000 035b 0000 315f 0012 87d8 0000 0038 b27c b66c 0000 0c22 0000 0c70
2517440 0012 87dc 0200 0db5 0500 1cdd 0000 68df 0000 0013 0000 3287 0096 3a83 0000 035b 0000 315f 0012 8810 0000 0038 b27c b66c
2517520 0000 0c23 0000 0c71 0012 8814 0200 0db5 0500 1cdd 0000 5ee7 0000 000b 0000 3287 0093 b223 0000 035b 0000 315f 0012 8848
2517600 0000 0038 b27c b66c 0000 0c24 0000 0c72 0012 884c 0200 0db5 0500 1cdd 0000 68e7 0000 0013 0000 3287 0096 3ea3 0000 035b
2517660 0000 315f 0012 8880 0000 0038 b27c b66c 0000 0c25 0000 0c73 0012 8884 0200 0db5 0500 1cdd 0000 5fdf 0000 0013 0000 3287
2517740 0090 0be3 0000 035b 0000 315f 0012 88b8 0000 0038 b27c b66c 0000 0c26 0000 0c74 0012 88bc 0200 0db5 0500 1cdd 0000 68ef
2520020 0000 0013 0000 3287 0096 4243 0000 035b 0000 315f 0012 88f0 0000 0038 b27c b66c 0000 0c27 0000 0c75 0012 88f4 0200 0db5
2520100 0500 1cdd 0000 68f7 0000 0013 0000 3287 0096 44e3 0000 035b 0000 315f 0012 8928 0000 0038 b27c b66c 0000 0c28 0000 0c76
2520160 0012 892c 0200 0db5 0500 1cdd 0000 68ff 0000 0013 0000 3287 0096 4783 0000 035b 0000 315f 0012 8960 0000 0038 b27c b66c
2520240 0000 0c29 0000 0c77 0012 8964 0200 0db5 0500 1cdd 0000 6907 0000 0013 0000 3287 0096 4a23 0000 035b 0000 315f 0012 8998
2520320 0000 0038 b27c b66c 0000 0c2a 0000 0c78 0012 899c 0200 0db5 0500 1cdd 0000 690f 0000 0013 0000 3287 0096 4ce3 0000 035b
2520400 0000 315f 0012 89d0 0000 0038 b27c b66c 0000 0c2b 0000 0c79 0012 89d4 0200 0db5 0500 1cdd 0000 655f 0000 0013 0000 3287
2520460 0093 c7c3 0000 035b 0000 315f 0012 8a08 0000 0038 b27c b66c 0000 0c2c 0000 0c7a 0012 827c 0200 0db5 0500 1cdd 0000 6917
2520540 0000 0013 0000 3287 0096 50a3 0000 035b 0000 315f 0012 8a88 0000 0080 0012 ca24 0012 ca84 0000 0000 0012 cb14 0012 cb54
2520620 0000 0000 0000 0000 0000 0000 0000 0000 0012 c9cc 0012 cb84 0000 0000 0000 0012 cac4 0000 0000 0000 0000 0000 0000
2520700 0012 cad4 0000 0000 000b 687d 0012 cb74 0000 0000 0012 cbb8 0000 0000 0000 0000 0000 0000 0000 0000 0000 0000 0012 c8ac
2520760 0012 c900 0012 8c08 0000 0180 0012 ca24 0012 ca84 0000 0000 0012 cb14 0012 cb54 0012 c4ec 0000 0000 0012 c6a8 0000 0000
2521040 0012 c9cc 0012 cb84 0000 0000 0000 0000 0000 0000 0000 0000 0000 0000 0000 0000 0000 0000 0000 0012 caa4 0000 0000
2521120 0000 0000 0000 0000 0000 0000 0000 0000 0000 0000 0000 0000 0000 0000 0000 0000 0000 0000 0000 0000 0000 0000 0000 0000
2521200 0000 0000 0000 0000 0000 0000 0011 2ef4 0000 0000 0000 0000 0000 0000 0000 0000 0000 0000 0000 0000 0000 0000 0000 0000
2521260 0000 0000 0000 0000 0000 0000 0000 0000 0000 0000 0000 0000 0000 0000 0000 0000 0000 0011 3d54 0000 0000 0000 0000
2521340 0000 0000 0012 c780 0000 0000 0000 0000 0000 0000 0000 0000 0000 0000 0000 0000 0000 0000 0000 0000 0000 0000 0000 0000
2521420 0011 50f8 0012 c468 0000 0000 0000 0000 0000 0000 0000 0000 0000 0000 0000 0000 0012 cac4 0000 0000 0000 0000 0000 0000
2521500 0012 cad4 0000 0000 0012 cb64 000f d191 0011 2fd0 000b 563c 0011 3198 0011 32d8 000a d75d 0011 3470 0011 3618 0011 3758
2521560 0011 3a44 0012 8c90 0000 0033 b27c b66c 0000 0c30 0000 0c7e 0012 8c94 0200 0db5 0500 1cdd 0000 5f9f 0000 001b 0000 3287
2521640 0090 0123 0000 035b 0000 315f 2c78 0050 0002 438a 45b8 4714 4754 39a4 0012 74b4 0020 3380 001c 42ac 0000 5237 0011 be4c
2521720 0020 3e70 001c 39a4 0012 b450 001c 3348 3c48 0000 0012 11d8 0018 3d3c 3b4c 0000 0012 bdf0 0014 2330 0012 be24 0012 8d20
2522000 0000 0038 b27c b66c 0000 0c31 0000 0c7f 0012 8d24 0200 0db5 0500 1cdd 0000 692f 0000 0013 0000 3287 0096 5823 0000 035b
2522060 0000 315f 2c78 0058 0002 438a 45b8 46ec 3b4c 0000 0012 7520 001c 3364 4300 0000 0000 52c7 0011 be4c 001c 32b8 24d0 0000
2522140 0012 029c 001c 39a4 0012 7520 001c 3d48 3b4c 0000 0012 bfa4 0018 3d3c 3b4c 0000 0012 c018 0014 2330 0012 c038 0012 8db0
2522220 0000 0038 b27c b66c 0000 0c32 0000 0c80 0012 8db4 0200 0db5 0500 1cdd 0000 6937 0000 0013 0000 3287 0096 5a23 0000 035b
2522300 0000 315f 2c78 0058 0002 438a 45b8 46ec 3b4c 0000 0012 758c 001c 3364 4300 0000 0000 533f 0011 be4c 001c 32b8 24d0 0000
2522360 0012 029c 001c 39a4 0012 758c 001c 3d48 3b4c 0000 0012 c1a4 0018 3d3c 3b4c 0000 0012 c22c 0014 2330 0012 c280 0012 8e2c
2522440 0000 0038 b27c b66c 0000 0c33 0000 0c81 0012 8e30 0200 0db5 0500 1cdd 0000 5faf 0000 000b 0000 3287 0090 0603 0000 035b
2522520 0000 315f 2c78 0044 0002 438a 45b8 39a4 0012 740c 0018 3348 4300 0000 0000 5347 0011 be4c 0018 333c 3b4c 0000 0012 c4bc
2522600 0014 329c 24d0 0000 0012 029c 0014 3d30 2420 0000 0012 c580 0012 8ea8 0000 0038 b27c b66c 0000 0c34 0000 0c82 0012 8eac
2522660 0200 0db5 0500 1cdd 0000 5fb7 0000 000b 0000 3287 0090 0703 0000 035b 0000 315f 2c78 0044 0002 438a 45b8 39a4 0012 7644
```

```
2522740 0018 3348 4300 0000 0000 5ee7 0011 be4c 0018 333c 3b4c 0000 0012 c7d4 0014 329c 24d0 0000 0012 029c 0014 3330 2420 0000
2523020 0012 c89c 0012 8f44 0000 0070 b27c b66c 0000 0c35 0000 0c83 0012 8ee4 0200 0db5 0500 1cdd 0000 6557 0000 000b 0000 3287
2523100 0093 caa3 0000 035b 0090 315f 0012 8f44 0000 0038 b130 b66c 0000 0c36 0000 0c84 0012 7ac9 0200 04b5 0500 1cdd 0000 60c7
2523160 0000 0013 0000 3287 0090 38a3 0000 035b 0000 315f 2c78 002c 0002 438a 45b9 46ec 3348 42ac 0000 5ef7 0011 be4c 0018 3d3c
2523240 3b4c 0000 0011 ecb8 0014 2330 0012 4ce0 0012 9b78 0000 0ab8 0000 0000 0012 cad4 0000 0000 000b 3ee5 000e 7a79 0000 0000
2523320 0012 cbb8 0000 0000 0000 0000 0000 0000 0012 cb84 0000 0000 0000 0000 0012 cac4 0012 9044 0000 90c0 0000 0000 0012 c448
2523400 0012 c4cc 0012 c53c 0012 c590 0012 c5e0 000b 3ee5 0012 c688 0012 c700 0012 c760 0012 7ce5 0012 c858 0012 c8ac 0012 c900
2523460 0012 c954 0012 c9ac 0012 ca24 0012 ca84 0000 0000 0012 cb14 0012 cb54 0012 c4ec 0012 c468 0012 c6a8 0000 0000 0012 c9cc
2523540 0012 cb84 0000 0000 0000 0000 0012 cac4 0000 0000 0000 0000 0000 0000 0012 cad4 0000 0000 000b 687d 0012 cb74 0000 0000
2523620 0000 0000 0000 0000 0000 0000 0012 c804 0000 0000 0000 0000 0000 0000 0000 0000 0012 9b78 0000 09b8 0000 030b 0012 9052
2523700 0000 017b 0012 905a 0000 03b3 0012 9062 0000 034b 0012 906a 0000 0353 0012 9072 0000 030b 0012 907a 0000 03cb 0012 9082
2523760 0000 017b 0012 908a 0000 02b3 0012 9092 0000 0243 0012 909a 0000 0223 0012 90a2 0000 0263 0012 90aa 0000 017b 0012 90b2
2524040 0000 0383 0012 90ba 0000 030b 0012 90c2 0000 0393 0012 90ca 0000 039b 0012 90d2 0000 032b 0012 90da 0000 0393 0012 90e2
2524120 0000 017b 0012 90ea 0000 0383 0012 90f2 0000 0393 0012 90fa 0000 037b 0012 9102 0000 0363 0012 910a 0000 037b 0012 9112
2524200 0000 033b 0012 911a 0000 017b 0012 9122 0000 0373 0012 912a 0000 032b 0012 9132 0000 03bb 0012 913a 0000 0373 0012 9142
2524260 0000 032b 0012 914a 0000 03bb 0012 9152 0000 017b 0012 915a 0000 03b3 0012 9162 0000 019b 0012 916a 0000 0173 0012 9172
2524340 0000 018b 0012 917a 0000 017b 0012 9192 0000 0393 0012 918a 0000 03ab 0012 9192 0000 0373 0012 8e1a 0000 2473 0012 91a2
2524420 0000 0533 0000 0007 0016 2e43 0012 91b2 0001 88e3 0000 0007 0000 017b 0012 91c2 0000 0343 0012 91ca 0000 037b 0012 91d2
2524500 0000 036b 0012 91da 0000 032b 0012 91e2 0000 017b 0012 91ea 0000 037b 0012 91f2 0000 039b 0012 91fa 0000 030b 0012 9202
2524560 0000 039b 0012 920a 0000 018b 0012 9212 0000 017b 0012 921a 0000 030b 0012 9222 0000 017b 0012 922a 0000 03b3 0012 9232
2524640 0000 034b 0012 923a 0000 0353 0012 9242 0000 030b 0012 924a 0000 03cb 0012 9252 0000 017b 0012 925a 0000 02b3 0012 9262
2524720 0000 0243 0012 926a 0000 0223 0012 9272 0000 0263 0012 927a 0000 017b 0012 9282 0000 0383 0012 928a 0000 030b 0012 9292
2525000 0000 0393 0012 929a 0000 039b 0012 92a2 0000 032b 0012 92aa 0000 0393 0012 92b2 0000 017b 0012 92ba 0000 0383 0012 92c2
2525060 0000 0393 0012 92ca 0000 037b 0012 92d2 0000 0363 0012 92da 0000 037b 0012 92e2 0000 033b 0012 92ea 0000 017b 0012 92f2
2525140 0000 0373 0012 92fa 0000 032b 0012 9302 0000 03bb 0012 930a 0000 0373 0012 9312 0000 032b 0012 931a 0000 03bb 0012 9322
2525220 0000 017b 0012 932a 0000 03b3 0012 9332 0000 019b 0012 933a 0000 0173 0012 9342 0000 018b 0012 934a 0000 017b 0012 9352
2525300 0000 0393 0012 935a 0000 03ab 0012 9362 0000 0373 0012 936a 0000 0173 0012 9372 0000 0383 0012 937a 0000 0363 0000 0007
2525360 0000 017b 0012 9352 0012 938e 0000 017b 0012 9396 0000 0343 0012 939e 0000 037b 0012 93a6 0000 036b 0012 93ae 0000 032b
2525440 0012 93b6 0000 017b 0012 93be 0000 037b 0012 93c6 0000 039b 0012 93ce 0000 030b 0012 93d6 0000 039b 0012 93de 0000 018b
2525520 0012 93e6 0000 017b 0012 93ee 0000 030b 0012 93f6 0000 017b 0012 93fe 0000 03b3 0012 9406 0000 034b 0012 940e 0000 0353
2525600 0012 9416 0000 030b 0012 941e 0000 03cb 0012 9426 0000 017b 0012 942e 0000 02b3 0012 9436 0000 0243 0012 943e 0000 0223
2525660 0012 9446 0000 0263 0012 944e 0000 017b 0012 9456 0000 0383 0012 945e 0000 030b 0012 9466 0000 0393 0012 946e 0000 039b
2525740 0012 9476 0000 032b 0012 947e 0000 0393 0012 9486 0000 017b 0012 948e 0000 0383 0012 9496 0000 0393 0012 949e 0000 037b
2526020 0012 94a6 0000 0363 0012 94ae 0000 037b 0012 94b6 0000 033b 0012 94be 0000 017b 0012 94c6 0000 0373 0012 94ce 0000 032b
2526100 0012 94d6 0000 03bb 0012 94de 0000 0373 0012 94e6 0000 032b 0012 94ee 0000 03bb 0012 94f6 0000 017b 0012 94fe 0000 03b3
2526160 0012 9506 0000 019b 0012 950e 0000 0173 0012 9516 0000 018b 0000 0007 0200 09cf 0000 001b 0000 001b 0200 0daf 0000 001f
2526240 0000 26ff 0100 33ff 0000 000b 0100 15af 0000 0007 0200 0db7 0012 953d 0000 315f 0200 0db7 0012 955d 0000 315f 0100 15af
2526320 0000 0007 0000 37ff 0000 0007 0000 1fbf 0012 9566 0000 0103 0012 956e 0000 0003 0012 9576 0300 22f7 0000 3287 0000 3547
2526400 0012 957e 0000 000b 0000 0003 0200 09cf 0000 0003 0000 000b 0200 2f37 0000 37ff 0000 022b 0000 0013 0000 2f37 0200 0ad7
2526460 0000 0057 0000 0007 0200 0db7 0012 95a9 0000 315f 0056 91c3 0000 017b 0012 95e2 0000 0343 0012 95ea 0000 037b 0012 95f2
2526540 0000 036b 0012 95fa 0000 032b 0012 9602 0000 017b 0012 960a 0000 037b 0012 9612 0000 039b 0012 961a 0000 030b 0012 9622
2526620 0000 039b 0012 962a 0000 018b 0012 9632 0000 017b 0012 963a 0000 030b 0012 9642 0000 017b 0012 964a 0000 03b3 0012 9652
2526700 0000 034b 0012 965a 0000 0353 0012 9662 0000 030b 0012 966a 0000 03cb 0012 9672 0000 017b 0012 967a 0000 02b3 0012 9682
2526760 0000 0243 0012 968a 0000 0223 0012 9692 0000 0263 0012 969a 0000 017b 0012 96a2 0000 0383 0012 96aa 0000 030b 0012 96b2
2527040 0000 0393 0012 96ba 0000 039b 0012 96c2 0000 032b 0012 96ca 0000 0393 0012 96d2 0000 017b 0012 96da 0000 0383 0012 96e2
2527120 0000 0393 0012 96ea 0000 037b 0012 96f2 0000 0363 0012 96fa 0000 037b 0012 9702 0000 033b 0012 970a 0000 017b 0012 9712
2527200 0000 0373 0012 971a 0000 032b 0012 9722 0000 03bb 0012 972a 0000 0373 0012 9732 0000 032b 0012 973a 0000 03bb 0012 9742
2527260 0000 017b 0012 974a 0000 03b3 0012 9752 0000 019b 0012 975a 0000 0173 0012 9762 0000 018b 0012 976a 0000 017b 0012 9772
2527340 0000 0393 0012 977a 0000 03ab 0012 9782 0000 0373 0012 978a 0000 0173 0012 9792 0000 0383 0012 979a 0000 0363 0000 0007
2527420 0000 017b 0012 9772 0000 017b 0012 97b2 0000 0343 0012 97ba 0000 037b 0012 97c2 0000 036b 0012 97ca 0000 032b 0012 97d2
2527500 0000 017b 0012 97da 0000 037b 0012 97e2 0000 039b 0012 97ea 0000 030b 0012 97f2 0000 039b 0012 97fa 0000 018b 0012 9802
2527560 0000 017b 0012 980a 0000 030b 0012 9812 0000 017b 0012 981a 0000 03b3 0012 9822 0000 034b 0012 982a 0000 0353 0012 9832
2527640 0000 030b 0012 983a 0000 03cb 0012 9842 0000 017b 0012 984a 0000 02b3 0012 9852 0000 0243 0012 985a 0000 0223 0012 9862
2527720 0000 0263 0012 986a 0000 017b 0012 9872 0000 0383 0012 987a 0000 030b 0012 9882 0000 0393 0012 988a 0000 039b 0012 9892
2530000 0000 032b 0012 989a 0000 0393 0012 98a2 0000 017b 0012 98aa 0000 0383 0012 98b2 0000 0393 0012 98ba 0000 037b 0012 98c2
```

```
2530060  0000 0363 0012 98ca 0000 037b 0012 98d2 0000 033b 0012 98da 0000 017b 0012 98e2 0000 0373 0012 98ea 0000 032b 0012 98f2
2530140  0000 03bb 0012 98fa 0000 0373 0012 9902 0000 032b 0012 990a 0000 03bb 0012 9912 0000 017b 0012 991a 0000 03b3 0012 9922
2530220  0000 019b 0012 992a 0000 0173 0012 9932 0000 018b 0000 0007 0500 26f7 0000 1fc7 0000 26ef 0000 022b 0012 951d 0000 3807
2530300  0200 0ad7 0000 0057 0000 0007 0200 0db7 0012 9939 0000 315f 0056 8763 0000 0007 1000 32cf 0012 9974 0012 9978 0012 997c
2530360  0012 9980 0012 9984 0012 9988 0012 998c 0012 9990 0012 9994 0012 9998 0012 999c 0012 99a0 0012 99a4 0012 99a8 0012 99ac
2530440  0012 99b0 0100 1d8f 0000 0db7 0012 99b5 0012 99ce 0100 1d8f 0000 2177 0012 99c5 0012 99d6 0000 0a0f 0012 99de 0000 1677
2530520  0012 99ee 0100 1d8f 0000 380f 0012 99e5 0012 99f6 0000 1797 27f0 99fe 0012 9a7c 2ca0 0007 0000 000c 0003 0004 000b 7b60
2530600  0012 9a7c 0002 438a 0010 d778 28c4 0020 0012 9a3c 4e1c 0000 0000 5237 4240 0000 0000 5ed7 239c 0000 0011 ffa0 28c4 0020
2530660  0012 9a5c 4e1c 0000 0000 5347 4240 0000 0000 5e17 239c 0000 0011 ffa0 28c4 0020 0012 9a7c 4e1c 0000 0000 5ee7 4240 0000
2530740  0000 5ed7 239c 0000 0011 ffa0 2954 001c 0002 438a 362c 43c0 0200 2027 6bc8 6b88 239c 0000 0012 0c40 27f0 0ad7 0012 9adc
2531020  2ca0 0007 0000 001c 0000 0005 0012 530c 0012 9adc 0002 438a 0012 9abc 000e 6c61 0000 0000 0000 0000 0000 0000 0012 53c0
2531100  0000 0000 000b 2cb1 0000 0000 2954 001c 0002 438a 362c 43c0 0200 2027 6bc8 6b88 239c 0000 0012 08d8 27f0 9af8 0012 9b1c
2531160  2ca0 0db7 0000 000c 0000 0004 0012 5480 0012 9b1c 0002 438a 0010 dac4 2954 001c 0002 438a 362c 43c0 0200 2027 6bc8 6b88
2531240  239c 0000 0012 738c 0017 7668 646c 5f73 6f75 7263 655f 6c69 6e65 5f6e 756d 6265 7200 9b56 0011 1dfc 0100 674f 0000 3287
2531320  0000 0004 0012 5598 0012 5598 0001 006a 0000 0000 0012 9c94 0000 002c b288 b66c 0000 0c85 7fff ffff 0012 cbc0 0200 0db5
2531400  0100 15ad 0100 33fd 0000 000b 0000 315f 003b 2f68 6f6d 652f 6f73 6173 312f 612f 7669 6a61 792f 5648 444c 2f70 6172 7365
2531460  722f 7072 6f6c 6f67 2f6e 6577 6e65 772f 7633 2e31 2f73 6368 6564 756c 6500 7469 003e 2f68 6f6d 652f 6f73 6173 312f 612f
2531540  7669 6a61 792f 5648 444c 2f70 6172 7365 722f 7072 6f6c 6f67 2f6e 6577 6e65 772f 7633 2e31 2f73 6368 6564 756c 652e 706c
2531620  006e 7469 0000 002c 0012 a80c b27c b66c 0000 0c88 7fff ffff 0012 79f8 0200 0db5 0200 2f35 0000 6957 0000 0363 0000 315f
2531700  0000 002c 0012 c1a4 b27c b66c 0000 0cdd 7fff ffff 0012 a864 0200 0db5 0200 224d 0000 6957 0000 3287 0000 315f 000f 636c
2531760  7573 7465 725f 7375 7070 6f72 7400 0000 0012 9fac 0000 0250 b27c b66c 0000 0c8a 0000 0cdc 000a d16d 0200 0db5 0200 270d
2532040  0000 6957 0000 3287 0000 315f 0012 9cf8 0000 0038 b27c b66c 0000 0c8b 0000 0cde 0012 9d28 0200 0db5 0500 1cdd 0000 695f
2532120  0000 001b 0000 3287 0097 5e83 0000 0363 0000 315f 0012 9d24 0000 002c b4f0 b4e4 0000 0c8a 7fff ffff 0008 b0dd 0000 0000
2532200  0000 0000 0012 f440 0002 438a 0010 e3a8 0012 9d5c 0000 0038 b27c b66c 0000 0c8c 0000 0cdf 0012 9d60 0200 0db5 0500 1cdd
2532260  0000 6967 0000 001b 0000 3287 0097 5f83 0000 0363 0000 315f 0012 9d94 0000 0038 b27c b66c 0000 0c8d 0000 0ce0 0012 9d98
2532340  0200 0db5 0500 1cdd 0000 696f 0000 0013 0000 3287 0097 6143 0000 0363 0000 315f 0012 9dcc 0000 0038 b27c b66c 0000 0c8e
2532420  0000 0ce1 0012 9dd0 0200 0db5 0500 1cdd 0000 6947 0000 002b 0000 3287 0097 6243 0000 0363 0000 315f 0012 9e04 0000 0038
2532500  b27c b66c 0000 0c8f 0000 0ce2 0012 9e08 0200 0db5 0500 1cdd 0000 6977 0000 001b 0000 3287 0097 6343 0000 0363 0000 315f
2532560  0012 9e3c 0000 0038 b27c b66c 0000 0c90 0000 0ce3 0012 9e40 0200 0db5 0500 1cdd 0000 695f 0000 002b 0000 3287 0097 6543
2532640  0000 0363 0000 315f 0012 9e74 0000 0038 b27c b66c 0000 0c91 0000 0ce4 0012 9e78 0200 0db5 0500 1cdd 0000 6967 0000 002b
2532720  0000 3287 0097 6643 0000 0363 0000 315f 0012 9eac 0000 0038 b27c b66c 0000 0c92 0000 0ce5 0012 9eb0 0200 0db5 0500 1cdd
2533000  0000 696f 0000 001b 0000 3287 0097 67e3 0000 0363 0000 315f 0012 9fac 0000 0038 b27c b66c 0000 0c93 0000 0ce6 0012 9fb0
2533060  0200 0db5 0500 1cdd 0000 697f 0000 0013 0000 3287 0097 6b83 0000 0363 0000 315f 27f0 006c 0012 9f4c 45b8 46ec 3b4c 0000
2533140  0012 4e30 0020 37dc 32f0 001c 2400 0000 0012 0fe4 0020 3c9c 0000 001c 0012 1090 0020 3364 40b4 001c 0012 36d4 001c 3d48
2533220  32b8 247c 000a f4bc 0018 3858 4254 0000 0000 000b 40f4 0000 0012 ed90 0014 37f0 3b4c 0000 0012 edb0 000c 2eb0 2954 005c
2533300  0002 438a 45e8 001c 46ec 3c9c 0000 001c 0012 0fa4 0020 3310 3af4 001c 0012 0fe4 0020 3364 3af4 001c 0012 36d4 001c 3d48
2533360  32b8 247c 000a f4bc 0018 3858 4254 0000 0000 000b 40f4 0000 0012 ed90 0014 37f0 3cf4 234c 0012 edb0 0012 a094 0000 00a8
2533440  b27c b66c 0000 0c94 0000 0ce7 0012 9fe8 0200 0db5 0500 1cdd 0000 698f 0000 0013 0000 3287 0097 6d83 0000 0363 0000 315f
2533520  0012 a01c 0000 0038 b27c b66c 0000 0c95 0000 0ce8 0012 a020 0200 0db5 0500 1cdd 0000 6997 0000 0013 0000 3287 0097 7043
2533600  0000 0363 0000 315f 0012 a094 0000 0038 b27c b66c 0000 0c96 0000 0ce9 0012 a098 0200 0db5 0500 1cdd 0000 699f 0000 0013
2533660  0000 3287 0097 7323 0000 0363 0000 315f 27f0 0040 0012 a444 45dc 46ec 3c48 0000 0012 0fa4 001c 9314 9410 3348 3c48 0000
2533740  0012 36d4 0018 313c 3280 247c 000a f4bc 0014 37f0 40cc 0000 0012 f0e4 000c 2eb0 0012 a190 0000 00a8 b27c b66c 0000 0c97
2534020  0000 0cea 0012 a0d0 0200 0db5 0500 1cdd 0000 69a7 0000 0013 0000 3287 0097 6443 0000 0363 0000 315f 0012 a104 0000 0038
2534100  b27c b66c 0000 0c98 0000 0ceb 0012 a108 0200 0db5 0500 1cdd 0000 6987 0000 0013 0000 3287 0097 75e3 0000 0363 0000 315f
2534160  0012 a190 0000 0038 b27c b66c 0000 0c99 0000 0cec 0012 a194 0200 0db5 0500 1cdd 0000 6987 0000 001b 0000 3287 0097 6c83
2534240  0000 0363 0000 315f 2954 0054 0002 438a 45b8 4700 4754 2ba0 0020 002e 33f4 37dc 32f0 001c 24d0 0000 000d d604 0020 3804
2534320  40b4 001c 0012 ef48 001c 3858 3d04 40a0 0012 e190 0018 2eb0 2c58 aa50 aaf0 0001 ac4c 3858 2420 0000 0012 ed90 0012 a1f8
2534400  0000 0038 b27c b66c 0000 0c9a 0000 0ced 0012 a1fc 0200 0db5 0500 1cdd 0000 69af 0000 0013 0000 3287 0097 7a43 0000 0363
2534460  0000 315f 2c78 0030 0002 438a 45b8 46ec 2e7c a1ec 2ba0 0018 0014 37f0 3b4c 0000 0012 efa0 0018 aa50 2e98 c5a8 2c58 2330
2534540  0012 efc0 0012 a268 0000 0038 b27c b66c 0000 0c9b 0000 0cee 0012 a26c 0200 0db5 0500 1cdd 0000 69b7 0000 0013 0000 3287
2534620  0097 7d03 0000 0363 0000 315f 2c78 0038 0002 438a 2520 4700 35c8 329c 24d0 0000 000b 7a14 0018 2e7c ad64 2ba0 0018 0012
2534700  3804 4078 0012 eff4 0010 aa18 2e98 c5a8 2c58 723c 0012 a2d4 0000 0038 b27c b66c 0000 0c9c 0000 0cef 0012 a2d8 0200 0db5
2534760  0500 1cdd 0000 69c7 0000 0013 0000 3287 0097 7fa3 0000 0363 0000 315f 2c78 0032 0002 438a 2520 46d8 3364 247c 0012 0508
2535040  001c 33bc 3348 40a0 0012 f02c 0018 2ecc aa50 aa18 a354 aa34 aa18 a354 22a0 6f6e 0012 a358 0000 0038 b27c b66c 0000 0c9d
2535120  0000 0cf0 0012 a35c 0200 0db5 0500 1cdd 0000 69bf 0000 0013 0000 3287 0097 7e03 0000 0363 0000 315f 2c78 004c 0002 438a
```

| | | | | | | | | | | | | | | | | | | | | | | | | |
|---|---|---|---|---|---|---|---|---|---|---|---|---|---|---|---|---|---|---|---|---|---|---|---|---|
| 2535200 | 45dc | 46d8 | 332c | 3aa0 | 0012 | 0508 | 001c | 3348 | 3c48 | 0000 | 0012 | 0938 | 0018 | 4538 | 6d0c | 5370 | 4550 | 6d94 | 6b74 | 42ac | 0000 | 69d7 | 0008 | c0fc |
| 2535260 | 0014 | 43c0 | 0300 | 695f | 6d50 | 6d0c | 6d0c | 234c | 0012 | 0c40 | 0012 | a3f4 | 0000 | 0070 | b27c | b66c | 0000 | 0c9e | 0000 | 0cf1 | 0012 | a394 | 0200 | 0db5 |
| 2535340 | 0500 | 1cdd | 0000 | 69cf | 0000 | 001b | 0000 | 3287 | 0097 | 8163 | 0000 | 0363 | 0000 | 315f | 0012 | a3f4 | 0000 | 0038 | b27c | b66c | 0000 | 0c9f | 0000 | 0cf2 |
| 2535420 | 0012 | a480 | 0200 | 0db5 | 0500 | 1cdd | 0000 | 69df | 0000 | 0013 | 0000 | 3287 | 0097 | 8623 | 0000 | 0363 | 0000 | 315f | 28c4 | 002c | 0013 | 35c8 | 56f8 | 6580 |
| 2535500 | 0018 | 92e4 | 0018 | 9a90 | 3050 | a8c9 | 0018 | a874 | 9db0 | aee8 | 3664 | 3614 | 0018 | 22bc | 0013 | 3580 | 0012 | a47c | 0000 | 0038 | b27c | b66c | 0000 | 0cc1 |
| 2535560 | 0000 | 0cd3 | 0012 | b588 | 0200 | 0db5 | 0500 | 1cdd | 0000 | 6a5f | 0000 | 001b | 0000 | 1e37 | 0099 | ac03 | 0000 | 036b | 0000 | 315f | 0016 | 6f70 | 6572 | 6174 |
| 2535640 | 6f72 | 735f | 696e | 5f73 | 6368 | 6564 | 756c | 6531 | 0012 | c468 | 2954 | 0034 | 0002 | 438a | 45d0 | 46ec | 3bf4 | 0000 | 0012 | 4e30 | 0018 | 3804 | 3280 | 247c |
| 2535720 | 0012 | 0fe4 | 0014 | 39a4 | 0012 | 1090 | 0014 | 37f0 | 3cf4 | 234c | 0012 | f0c4 | 0012 | a4fc | 0000 | 0038 | b27c | b66c | 0000 | 0ca0 | 0000 | 0cf3 | 0012 | a500 |
| 2536000 | 0200 | 0db5 | 0500 | 1cdd | 0000 | 69e7 | 0000 | 0013 | 0000 | 3287 | 0097 | 8723 | 0000 | 0363 | 0000 | 315f | 2954 | 0048 | 0002 | 438a | 45b8 | 46ec | 2ba0 | 001c |
| 2536060 | 0028 | 33d8 | 37dc | 32d4 | 24d0 | 0000 | 000d | d604 | 001c | 37f0 | 4108 | 0000 | 0012 | f158 | 0018 | 37f0 | 3d0c | 234c | 0012 | f0e4 | 2c58 | aa34 | aaf0 | ffff |
| 2536140 | 3c4c | 2340 | 0012 | f0e4 | 0012 | a564 | 0000 | 0038 | b27c | b66c | 0000 | 0ca1 | 0000 | 0cf4 | 0012 | a568 | 0200 | 0db5 | 0500 | 1cdd | 0000 | 69ef | 0000 | 0013 |
| 2536220 | 0000 | 3287 | 0097 | 8ac3 | 0000 | 0363 | 0000 | 315f | 2c78 | 0030 | 0002 | 438a | 45b8 | 46ec | 2e7c | adec | 2ba0 | 0018 | 0014 | 37f0 | 3b4c | 0000 | 0012 | f1b0 |
| 2536300 | 0018 | aa50 | 2e98 | c5a8 | 2c58 | 2330 | 0012 | f1d0 | 0012 | a5d0 | 0000 | 0038 | b27c | b66c | 0000 | 0ca2 | 0000 | 0cf5 | 0012 | a5d4 | 0200 | 0db5 | 0500 | 1cdd |
| 2536360 | 0000 | 69f7 | 0000 | 0013 | 0000 | 3287 | 0097 | 8d83 | 0000 | 0363 | 0000 | 315f | 2c78 | 0034 | 0002 | 438a | 2520 | 4700 | 332c | 247c | 000b | 7a14 | 0018 | 2e7c |
| 2536440 | ad64 | 2ba0 | 0018 | 0012 | 3804 | 4078 | 0012 | f204 | 0010 | aa18 | 2e98 | c5a8 | 2c58 | 723c | 0012 | a63c | 0000 | 0038 | b27c | b66c | 0000 | 0ca3 | 0000 | 0cf6 |
| 2536520 | 0012 | a640 | 0200 | 0db5 | 0500 | 1cdd | 0000 | 6a07 | 0000 | 0013 | 0000 | 3287 | 0097 | 9023 | 0000 | 0363 | 0000 | 315f | 2c78 | 0032 | 0002 | 438a | 2520 | 46d8 |
| 2536600 | 3364 | 247c | 0012 | 0508 | 001c | 33bc | 3348 | 40a0 | 0012 | f23c | 0018 | 2ecc | aa50 | aa18 | a484 | aa34 | aa18 | a484 | 22a0 | 7928 | 0012 | a834 | 0000 | 00a8 |
| 2536660 | b27c | b66c | 0000 | 0ca4 | 0000 | 0cf7 | 0012 | a678 | 0200 | 0db5 | 0500 | 1cdd | 0000 | 69ff | 0000 | 0013 | 0000 | 3287 | 0097 | 8e83 | 0000 | 0363 | 0000 | 315f |
| 2536740 | 0012 | a6ac | 0000 | 0038 | b27c | b66c | 0000 | 0ca5 | 0000 | 0cf8 | 0012 | a6b0 | 0200 | 0db5 | 0500 | 1cdd | 0000 | 6a0f | 0000 | 001b | 0000 | 3287 | 0097 | 91e3 |
| 2537020 | 0000 | 0363 | 0000 | 315f | 0012 | a834 | 0000 | 0038 | b27c | b56c | 0000 | 0ca6 | 0000 | 0cf9 | 0012 | f324 | 0200 | 0db5 | 0500 | 1cdd | 0000 | 6a17 | 0000 | 0013 |
| 2537100 | 0000 | 3287 | 0097 | 95a3 | 0000 | 0363 | 0000 | 315f | 2c78 | 0048 | 0002 | 438a | 45e8 | 001c | 46d8 | 3c9c | 0000 | 001c | 0012 | 7690 | 0020 | 3364 | 3af4 | 001c |
| 2537160 | 0012 | 0508 | 001c | 3228 | 332c | 3aa0 | 0012 | f02c | 001c | 3228 | 3348 | 40a0 | 0012 | f23c | 0018 | aa50 | aa34 | 9db0 | af34 | 723c | 002b | 2f68 | 6f6d | 652f |
| 2537240 | 6f73 | 6173 | 322f | 622f | 7175 | 696e | 7475 | 732f | 7077 | 312e | 312f | 6c69 | 6272 | 6172 | 792f | 6265 | 7477 | 6565 | 6e00 | 6e74 | 002e | 2f68 | 6f6d | 652f |
| 2537320 | 6f73 | 6173 | 322f | 622f | 7175 | 696e | 7475 | 732f | 7077 | 312e | 312f | 6c69 | 6272 | 6172 | 792f | 6265 | 7477 | 6565 | 6e2e | 706c | 0072 | 655f | 0036 | 2f68 |
| 2537400 | 6f6d | 652f | 6f73 | 6173 | 322f | 622f | 7175 | 696e | 7475 | 732f | 6765 | 6e65 | 7269 | 632f | 7170 | 6c69 | 6232 | 2e35 | 2f6c | 6962 | 7261 | 7279 | 2f62 | 6574 |
| 2537460 | 7765 | 656e | 000a | 7072 | 0039 | 2f68 | 6f6d | 652f | 6f73 | 6173 | 322f | 622f | 7175 | 696e | 7475 | 732f | 6765 | 6e65 | 7269 | 632f | 7170 | 6c69 | 6232 | 2e35 |
| 2537540 | 2f6c | 6962 | 7261 | 7279 | 2f62 | 6574 | 7765 | 656e | 2e70 | 6c00 | 0000 | 002c | 0012 | cd78 | b27c | b66c | 0000 | 0ca9 | 7fff | ffff | 0012 | 9c2c | 0200 | 0db5 |
| 2537620 | 0200 | 2f35 | 0000 | 6a37 | 0000 | 036b | 0000 | 315f | 0012 | aa30 | 0000 | 002c | b288 | b66c | 0000 | 0ca8 | 7fff | ffff | 0012 | a80c | 0200 | 0db5 | 0100 | 15ad |
| 2537700 | 0100 | 33fd | 0000 | 000b | 0000 | 315f | 0000 | 002c | 0012 | 9c58 | b27c | b66c | 0000 | 0cc6 | 7fff | ffff | 0012 | 7a24 | 0200 | 0db5 | 0200 | 224d | 0000 | 6a37 |
| 2537760 | 0000 | 1e37 | 0000 | 315f | 27f0 | 0014 | 0012 | f354 | 4e1c | 0000 | 0000 | 0007 | 54a8 | 2edc | 0000 | 002c | 000a | 29fc | b27c | b66c | 0000 | 0cc7 | 7fff | ffff |
| 2540040 | 0013 | f3e0 | 0200 | 0db5 | 0200 | 24b1 | 0000 | 3287 | 0000 | 1e37 | 0000 | 315f | 0000 | 002c | 000a | 2edc | b27c | b66c | 0000 | 0cad | 7fff | ffff | 0013 | eac4 |
| 2540120 | 0200 | 0db5 | 0200 | 244d | 0000 | 1e37 | 0000 | 6a37 | 0000 | 315f | 0000 | 0034 | 000a | 2960 | b27c | b66c | 0000 | 0cae | 7fff | ffff | 0012 | a930 | 0200 | 0db5 |
| 2540200 | 0400 | 242d | 0000 | 1e37 | 0000 | 001b | 0000 | 1e37 | 0000 | 21cf | 0000 | 315f | 0000 | 0034 | 0012 | a8fc | b27c | b66c | 0000 | 0caf | 7fff | ffff | 0012 | a964 |
| 2540260 | 0200 | 0db5 | 0400 | 242d | 0000 | 6a3f | 0000 | 000b | 0000 | 1e37 | 0000 | 21cf | 0000 | 315f | 0000 | 0034 | 0012 | a930 | b27c | b66c | 0000 | 0cb0 | 7fff | ffff |
| 2540340 | 0012 | a998 | 0200 | 0db5 | 0400 | 242d | 0000 | 6a47 | 0000 | 000b | 0000 | 1e37 | 0000 | 21cf | 0000 | 315f | 0000 | 0034 | 0012 | a964 | b27c | b66c | 0000 | 0cb1 |
| 2540420 | 7fff | ffff | 0012 | a9cc | 0200 | 0db5 | 0400 | 242d | 0000 | 6a4f | 0000 | 001b | 0000 | 1e37 | 0000 | 21cf | 0000 | 315f | 0000 | 0034 | 0012 | a998 | b27c | b66c |
| 2540500 | 0000 | 0cb2 | 7fff | ffff | 0013 | eaf0 | 0200 | 0db5 | 0400 | 242d | 0000 | 2d4f | 0000 | 000b | 0000 | 1e37 | 0000 | 21cf | 0000 | 315f | 0000 | 0034 | 0010 | 6404 |
| 2540560 | b27c | b66c | 0000 | 0cb4 | 7fff | ffff | 0014 | 3a14 | 0200 | 0db5 | 0400 | 24ad | 0000 | 28e7 | 0000 | 001b | 0000 | 1e37 | 0000 | 31c7 | 0000 | 315f | 0012 | b0b8 |
| 2540640 | 0000 | 05ec | b288 | b66c | 0000 | 0cb3 | 7fff | ffff | 0012 | aa00 | 0200 | 0db5 | 0100 | 15ad | 0100 | 33fd | 0200 | 0b3d | 0000 | 1f77 | 0000 | 000b | 0000 | 315f |
| 2540720 | 0012 | aa98 | 0000 | 0034 | b288 | b66c | 0000 | 0cb3 | 7fff | ffff | 0012 | aa34 | 0200 | 0db5 | 0100 | 15ad | 0100 | 33fd | 0200 | 0b3d | 0000 | 1fd7 | 0000 | 000b |
| 2541000 | 0000 | 315f | 0012 | aacc | 0000 | 0034 | b288 | b66c | 0000 | 0cb3 | 7fff | ffff | 0012 | aa68 | 0200 | 0db5 | 0100 | 15ad | 0100 | 33fd | 0200 | 0b3d | 0000 | 1ff7 |
| 2541060 | 0000 | 000b | 0000 | 315f | 0012 | ab00 | 0000 | 0034 | b288 | b66c | 0000 | 0cb3 | 7fff | ffff | 0012 | aa9c | 0200 | 0db5 | 0100 | 15ad | 0100 | 33fd | 0200 | 0b3d |
| 2541140 | 0000 | 240f | 0000 | 000b | 0000 | 315f | 0012 | ab34 | 0000 | 0034 | b288 | b66c | 0000 | 0cb3 | 7fff | ffff | 0012 | aad0 | 0200 | 0db5 | 0100 | 15ad | 0100 | 33fd |
| 2541220 | 0200 | 0b3d | 0000 | 2c1f | 0000 | 000b | 0000 | 315f | 0012 | ab68 | 0000 | 0034 | b288 | b66c | 0000 | 0cb3 | 7fff | ffff | 0012 | ab04 | 0200 | 0db5 | 0100 | 15ad |
| 2541300 | 0100 | 33fd | 0200 | 0b3d | 0000 | 2edf | 0000 | 000b | 0000 | 315f | 0012 | ab9c | 0000 | 0034 | b288 | b66c | 0000 | 0cb3 | 7fff | ffff | 0012 | ab38 | 0200 | 0db5 |
| 2541360 | 0100 | 15ad | 0100 | 33fd | 0200 | 0b3d | 0000 | 301f | 0000 | 000b | 0000 | 315f | 0012 | abd0 | 0000 | 0034 | b288 | b66c | 0000 | 0cb3 | 7fff | ffff | 0012 | ab6c |
| 2541440 | 0200 | 0db5 | 0100 | 15ad | 0100 | 33fd | 0200 | 0b3d | 0000 | 309f | 0000 | 0013 | 0000 | 315f | 0012 | ac04 | 0000 | 0034 | b288 | b66c | 0000 | 0cb3 | 7fff | ffff |
| 2541520 | 0012 | aba0 | 0200 | 0db5 | 0100 | 15ad | 0100 | 33fd | 0200 | 0b3d | 0000 | 28a7 | 0000 | 001b | 0000 | 315f | 0012 | ac38 | 0000 | 0034 | b288 | b66c | 0000 | 0cb3 |
| 2541600 | 7fff | ffff | 0012 | abd4 | 0200 | 0db5 | 0100 | 15ad | 0100 | 33fd | 0200 | 0b3d | 0000 | 28a7 | 0000 | 0023 | 0000 | 315f | 0012 | ac6c | 0000 | 0034 | b288 | b66c |
| 2541660 | 0000 | 0cb3 | 7fff | ffff | 0012 | ac08 | 0200 | 0db5 | 0100 | 15ad | 0100 | 33fd | 0200 | 0b3d | 0000 | 2ecf | 0000 | 001b | 0000 | 315f | 0012 | aca0 | 0000 | 0034 |
| 2541740 | b288 | b66c | 0000 | 0cb3 | 7fff | ffff | 0012 | ac3c | 0200 | 0db5 | 0100 | 15ad | 0100 | 33fd | 0200 | 0b3d | 0000 | 2ecf | 0000 | 0023 | 0000 | 315f | 0012 | acd4 |
| 2542020 | 0000 | 0034 | b288 | b66c | 0000 | 0cb3 | 7fff | ffff | 0012 | ac70 | 0200 | 0db5 | 0100 | 15ad | 0100 | 33fd | 0200 | 0b3d | 0000 | 28af | 0000 | 001b | 0000 | 315f |
| 2542100 | 0012 | ad08 | 0000 | 0034 | b288 | b66c | 0000 | 0cb3 | 7fff | ffff | 0012 | aca4 | 0200 | 0db5 | 0100 | 15ad | 0100 | 33fd | 0200 | 0b3d | 0000 | 28b7 | 0000 | 002b |
| 2542160 | 0000 | 315f | 0012 | ad3c | 0000 | 0034 | b288 | b66c | 0000 | 0cb3 | 7fff | ffff | 0012 | acd8 | 0200 | 0db5 | 0100 | 15ad | 0100 | 33fd | 0200 | 0b3d | 0000 | 28bf |
| 2542240 | 0000 | 001b | 0000 | 315f | 0012 | ad70 | 0000 | 0034 | b288 | b66c | 0000 | 0cb3 | 7fff | ffff | 0012 | ad0c | 0200 | 0db5 | 0100 | 15ad | 0100 | 33fd | 0200 | 0b3d |

| | | | | | | | | | | | | | | | | | | | | | | | | |
|---|---|---|---|---|---|---|---|---|---|---|---|---|---|---|---|---|---|---|---|---|---|---|---|---|
| 2542320 | 0000 | 28c7 | 0000 | 001b | 0000 | 315f | 0012 | ada4 | 0000 | 0034 | b288 | b66c | 0000 | 0cb3 | 7fff | ffff | 0012 | ad40 | 0200 | 0db5 | 0100 | 15ad | 0100 | 33fd |
| 2542400 | 0200 | 0b3d | 0000 | 28cf | 0000 | 001b | 0000 | 315f | 0012 | add8 | 0000 | 0034 | b288 | b66c | 0000 | 0cb3 | 7fff | ffff | 0012 | ad74 | 0200 | 0db5 | 0100 | 15ad |
| 2542460 | 0100 | 33fd | 0200 | 0b3d | 0000 | 28d7 | 0000 | 001b | 0000 | 315f | 0012 | ae0c | 0000 | 0034 | b288 | b66c | 0000 | 0cb3 | 7fff | ffff | 0012 | ada8 | 0200 | 0db5 |
| 2542540 | 0100 | 15ad | 0100 | 33fd | 0200 | 0b3d | 0000 | 28df | 0000 | 001b | 0000 | 315f | 0012 | ae40 | 0000 | 0034 | b288 | b66c | 0000 | 0cb3 | 7fff | ffff | 0012 | addc |
| 2542620 | 0200 | 0db5 | 0100 | 15ad | 0100 | 33fd | 0200 | 0b3d | 0000 | 28e7 | 0000 | 001b | 0000 | 315f | 0012 | ae74 | 0000 | 0034 | b288 | b66c | 0000 | 0cb3 | 7fff | ffff |
| 2542700 | 0012 | ae10 | 0200 | 0db5 | 0100 | 15ad | 0100 | 33fd | 0200 | 0b3d | 0000 | 28ef | 0000 | 001b | 0000 | 315f | 0012 | aea8 | 0000 | 0034 | b288 | b66c | 0000 | 0cb3 |
| 2542760 | 7fff | ffff | 0012 | ae44 | 0200 | 0db5 | 0100 | 15ad | 0100 | 33fd | 0200 | 0b3d | 0000 | 28f7 | 0000 | 001b | 0000 | 315f | 0012 | aedc | 0000 | 0034 | b288 | b66c |
| 2543040 | 0000 | 0cb3 | 7fff | ffff | 0012 | ae78 | 0200 | 0db5 | 0100 | 15ad | 0100 | 33fd | 0200 | 0b3d | 0000 | 28ff | 0000 | 001b | 0000 | 315f | 0012 | af10 | 0000 | 0034 |
| 2543120 | b288 | b66c | 0000 | 0cb3 | 7fff | ffff | 0012 | aeac | 0200 | 0db5 | 0100 | 15ad | 0100 | 33fd | 0200 | 0b3d | 0000 | 2907 | 0000 | 0023 | 0000 | 315f | 0012 | af44 |
| 2543200 | 0000 | 0034 | b288 | b66c | 0000 | 0cb3 | 7fff | ffff | 0012 | aee0 | 0200 | 0db5 | 0100 | 15ad | 0100 | 33fd | 0200 | 0b3d | 0000 | 290f | 0000 | 001b | 0000 | 315f |
| 2543260 | 0012 | af78 | 0000 | 0034 | b288 | b66c | 0000 | 0cb3 | 7fff | ffff | 0012 | af14 | 0200 | 0db5 | 0100 | 15ad | 0100 | 33fd | 0200 | 0b3d | 0000 | 2917 | 0000 | 001b |
| 2543340 | 0000 | 315f | 0012 | afac | 0000 | 0034 | b288 | b66c | 0000 | 0cb3 | 7fff | ffff | 0012 | af48 | 0200 | 0db5 | 0100 | 15ad | 0100 | 33fd | 0200 | 0b3d | 0000 | 291f |
| 2543420 | 0000 | 001b | 0000 | 315f | 0012 | afe4 | 0000 | 0038 | b27c | b66c | 0000 | 0cb5 | 0000 | 0cc8 | 0012 | afe8 | 0200 | 0db5 | 0500 | 1cdd | 0000 | 2def | 0000 | 000b |
| 2543500 | 0000 | 1e37 | 0099 | 9d43 | 0000 | 036b | 0000 | 315f | 0012 | b0b8 | 0000 | 0038 | b27c | b66c | 0000 | 0cb7 | 0000 | 0cc9 | 0012 | b0bc | 0200 | 0db5 | 0500 | 1cdd |
| 2543560 | 0000 | 1e37 | 0000 | 001b | 0000 | 1e37 | 0099 | 96e3 | 0000 | 036b | 0000 | 315f | 27f0 | 0044 | 0012 | b05c | 45b8 | 46ec | 4768 | 9300 | 9a90 | 9314 | 9a90 | 2ba0 |
| 2543640 | 0019 | 0016 | 9328 | 9a90 | 3050 | aa18 | aa50 | a538 | aa50 | aa34 | a538 | 22a0 | 2c58 | 9328 | 936c | 2ecc | aa18 | aa34 | a538 | 231c | 0013 | 3428 | 2954 | 0058 |
| 2543720 | 0002 | 438a | 2520 | 4700 | 4740 | 332c | 5d7c | 0000 | 0300 | 1e37 | 6b48 | 6d94 | 6d0c | 3858 | 4254 | 0000 | 0000 | 000b | 24d0 | 0000 | 0008 | cdfc | 0018 | 3858 |
| 2544000 | 4254 | 0000 | 0000 | 0013 | 3bf4 | 0000 | 0008 | cdfc | 0014 | 3160 | 4254 | 0000 | 0000 | 001b | 2420 | 0000 | 0008 | cdfc | 0012 | b170 | 0000 | 0070 | b27c | b66c |
| 2544060 | 0000 | 0cb8 | 0000 | 0cca | 0012 | b0f4 | 0200 | 0db5 | 0500 | 1cdd | 0000 | 6a57 | 0000 | 001b | 0000 | 1e37 | 0099 | a143 | 0000 | 036b | 0000 | 315f | 0012 | b170 |
| 2544140 | 0000 | 0038 | b27c | b66c | 0000 | 0cb9 | 0000 | 0ccb | 0012 | b174 | 0200 | 0db5 | 0500 | 1cdd | 0000 | 6a47 | 0000 | 000b | 0000 | 1e37 | 0098 | 98e3 | 0000 | 036b |
| 2544220 | 0000 | 315f | 2c78 | 0048 | 0002 | 438a | 45b8 | 9300 | 9afc | 000c | aa18 | aab4 | 0000 | a3ec | 22a0 | 9300 | 93a8 | 0012 | 37dc | 41d4 | 0000 | 0003 | 242c | 0000 |
| 2544300 | 0013 | 3460 | 44c4 | 0000 | 0100 | 6a47 | 6d0c | 41e8 | 0000 | 000b | 2420 | 0000 | 0008 | cdfc | 0012 | b220 | 0000 | 0070 | b27c | b66c | 0000 | 0cba | 0000 | 0ccc |
| 2544360 | 0012 | b1ac | 0200 | 0db5 | 0500 | 1cdd | 0000 | 6a47 | 0000 | 0013 | 0000 | 1e37 | 0099 | a303 | 0000 | 036b | 0000 | 315f | 0012 | b220 | 0000 | 0038 | b27c | b66c |
| 2544440 | 0000 | 0cbb | 0000 | 0ccd | 0012 | b224 | 0200 | 0db5 | 0500 | 1cdd | 0000 | 6a3f | 0000 | 000b | 0000 | 1e37 | 0098 | 97e3 | 0000 | 036b | 0000 | 315f | 2c78 | 0040 |
| 2544520 | 0002 | 438a | 45b8 | 9300 | 9afc | 0004 | 22a0 | 9300 | 93a8 | 0012 | 37dc | 41d4 | 0000 | 0003 | 242c | 0000 | 0013 | 3498 | 44c4 | 0000 | 0100 | 6a3f | 6d0c | 41e8 |
| 2544600 | 0000 | 000b | 2420 | 0000 | 0008 | cdfc | 0012 | b288 | 0000 | 0038 | b27c | b66c | 0000 | 0cbc | 0000 | 0cce | 0012 | b28c | 0200 | 0db5 | 0500 | 1cdd | 0000 | 6a3f |
| 2544660 | 0000 | 0013 | 0000 | 1e37 | 0099 | a4c3 | 0000 | 036b | 0000 | 315f | 2954 | 0030 | 0002 | 438a | 45d0 | 46ec | aa50 | aab4 | 0000 | a4bc | 000c | aa50 | 9d2c | ad64 |
| 2544740 | 2c88 | 000c | aab4 | 0001 | aa50 | 9db0 | ad64 | 2330 | 0013 | 3498 | 0012 | b2f8 | 0000 | 0038 | b27c | b66c | 0000 | 0cbd | 0000 | 0ccf | 0012 | b2fc | 0200 | 0db5 |
| 2545020 | 0500 | 1cdd | 0000 | 2d4f | 0000 | 000b | 0000 | 1e37 | 0098 | 9ae3 | 0000 | 036b | 0000 | 315f | 2c78 | 0038 | 0002 | 438a | 45b8 | 9300 | 9afc | 0012 | aa18 | aab4 |
| 2545100 | 0001 | a3ec | 2420 | 0000 | 0013 | 34b8 | 44c4 | 0000 | 0100 | 2d4f | 6d0c | 41e8 | 0000 | 000b | 2420 | 0000 | 0008 | cdfc | 0012 | b44c | 0000 | 0070 | b27c | b66c |
| 2545160 | 0000 | 0cbe | 0000 | 0cd0 | 0012 | b334 | 0200 | 0db5 | 0500 | 1cdd | 0000 | 6a7f | 0000 | 000b | 0000 | 1e37 | 0099 | a5c3 | 0000 | 036b | 0000 | 315f | 0012 | b44c |
| 2545240 | 0000 | 0038 | b27c | b66c | 0000 | 0cbf | 0000 | 0cd1 | 0012 | b450 | 0200 | 0db5 | 0500 | 1cdd | 0000 | 6a4f | 0000 | 001b | 0000 | 1e37 | 0098 | 99e3 | 0000 | 036b |
| 2545320 | 0000 | 315f | 28c4 | 0048 | 0012 | b3ac | 45e8 | 001c | 4714 | 4768 | 933c | 936c | 9350 | 001c | 936c | 344c | 33a0 | 41e8 | 0000 | 0003 | 3bf4 | 0000 | 0013 | 3560 |
| 2545400 | 0020 | 2ecc | 3cf4 | 4a7c | 001c | 3d00 | 4a7c | 0018 | 386c | 3d30 | 3cf4 | 234c | 0013 | 3540 | 28c4 | 0058 | 0012 | b404 | 45b8 | 46ec | 4768 | 33f4 | 4254 | 0000 |
| 2545460 | 0000 | 0003 | 3bf4 | 0000 | 0013 | 3580 | 001c | 2ba0 | 001c | 0018 | 9300 | 9a90 | 2ecc | aa18 | aa6c | 9d88 | aaf0 | ffff | af48 | 2c88 | 0016 | 2c58 | 9314 | 9a90 |
| 2545540 | 2ecc | aa34 | aa6c | 9db0 | aaf0 | 0001 | af34 | 231c | 0013 | 3540 | 2954 | 0044 | 0002 | 438a | 2520 | 46d8 | 332c | 5b58 | 0300 | 6a4f | 6b48 | 6d0c | 6bc8 | 3858 |
| 2545620 | 4254 | 0000 | 0000 | 000b | 24d0 | 0000 | 0008 | cdfc | 0014 | 3460 | 4254 | 0000 | 0000 | 0013 | 3b4c | 0000 | 0008 | cdfc | 000c | c5a8 | 0012 | b5f8 | 0000 | 0170 |
| 2545700 | b27c | b66c | 0000 | 0cc0 | 0000 | 0cd2 | 0012 | a3f8 | 0200 | 0db5 | 0500 | 1cdd | 0000 | 6a5f | 0000 | 0023 | 0000 | 1e37 | 0099 | ab03 | 0000 | 036b | 0000 | 315f |
| 2545760 | 0012 | b584 | 0000 | 0100 | 0012 | c3e8 | 0000 | 0000 | 0000 | 0000 | 0000 | 0000 | 0000 | 0000 | 0011 | 41f8 | 0011 | 44d4 | 0011 | 3d7c | 0000 | 0000 | 0011 | 3d54 |
| 2546040 | 0011 | 3a44 | 0011 | 3758 | 0000 | 0000 | 0011 | 3e30 | 0000 | 0000 | 0000 | 0000 | 0000 | 0000 | 0000 | 0000 | 0000 | 0000 | 0000 | 0000 | 0000 | 0000 | 0000 | 0000 |
| 2546120 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 |
| 2546200 | 0000 | 0000 | 0000 | 0000 | 0000 | 0000 | 0000 | 0000 | 0012 | ca24 | 0011 | 416c | 0000 | 0000 | 0012 | cb14 | 0012 | cac4 | 0012 | caa4 | 0012 | c9ac | 0012 | c954 |
| 2546260 | 0012 | c780 | 0012 | c900 | 0012 | c8ac | 0012 | c858 | 0012 | c804 | 0012 | c760 | 0012 | c700 | 0012 | c688 | 0012 | c6a8 | 0012 | c634 | 0000 | 0000 | 0012 | c5e0 |
| 2546340 | 0012 | c590 | 0012 | c53c | 0012 | c4ec | 0012 | c458 | 0012 | b5f8 | 0000 | 0038 | b27c | b66c | 0000 | 0cc2 | 0000 | 0cd4 | 0012 | b5fc | 0200 | 0db5 | 0500 | 1cdd |
| 2546420 | 0000 | 6a67 | 0000 | 001b | 0000 | 1e37 | 0099 | aa03 | 0000 | 036b | 0000 | 315f | 2c78 | 003c | 0002 | 438a | 45d0 | 46ec | 4740 | aa50 | aa34 | a554 | 0010 | 3844 |
| 2546500 | 37f0 | 379c | 242c | 0000 | 0013 | 3664 | aa50 | aa34 | aaf0 | 0001 | a1d0 | 000c | 3774 | 4c70 | 0000 | 0007 | 723c | c5a8 | 0012 | cbbc | 0000 | 0588 | b27c | b66c |
| 2546560 | 0000 | 0cc3 | 0000 | 0cd5 | 0012 | 9cfd | 0200 | 0db5 | 0500 | 1cdd | 0000 | 6a6f | 0000 | 001b | 0000 | 1e37 | 0099 | b323 | 0000 | 036b | 0000 | 315f | 0012 | cbbc |
| 2546640 | 0000 | 0550 | 7373 | 2c20 | 4d29 | 2c0a | 0963 | 7572 | 7265 | 6e74 | 5f70 | 6172 | 656e | 745f | 6964 | 2850 | 6172 | 656e | 7449 | 6429 | 2c20 | 0a09 | 7072 | 6f63 |
| 2546720 | 6573 | 735f | 7061 | 7265 | 6e74 | 2850 | 726f | 6365 | 7373 | 2c20 | 5061 | 7265 | 6e74 | 4964 | 292e | 0a0a | 2525 | 2525 | 206e | 6577 | 2073 | 7461 | 7465 | 626c |
| 2547000 | 6f63 | 6b0a | 0a6e | 6577 | 5f73 | 7461 | 7465 | 626c | 6f63 | 6b28 | 5374 | 6174 | 6562 | 6c6f | 636b | 2920 | 3a2d | 0a09 | 7374 | 6174 | 6562 | 6c6f | 636b | 2853 |
| 2547060 | 7461 | 7465 | 626c | 6f63 | 6b29 | 2c0a | 096e | 6577 | 5f63 | 6f75 | 6e74 | 2873 | 7461 | 7465 | 626c | 6f63 | 6b2c | 204d | 292c | 0a09 | 7374 | 6174 | 6562 | 6c6f |
| 2547140 | 636b | 5f6e | 756d | 6265 | 7228 | 5374 | 6174 | 6562 | 6c6f | 636b | 2c20 | 4d29 | 2c0a | 0963 | 7572 | 7265 | 6e74 | 5f70 | 6172 | 656e | 745f | 6964 | 2850 | 6172 |
| 2547220 | 656e | 7449 | 6429 | 2c0a | 0973 | 7461 | 7465 | 626c | 6f63 | 6b5f | 7061 | 7265 | 6e74 | 2853 | 7461 | 7465 | 626c | 6f63 | 6b2c | 2050 | 6172 | 656e | 7449 | 6429 |
| 2547300 | 2e0a | 0a25 | 2525 | 2520 | 6e65 | 7720 | 7661 | 7269 | 6162 | 6c65 | 0a0a | 6e65 | 775f | 7661 | 7269 | 6162 | 6c65 | 2856 | 6172 | 2920 | 3a2d | 0a09 | 6e65 | 775f |
| 2547360 | 636f | 756e | 7428 | 7661 | 7269 | 6162 | 6c65 | 2c20 | 4e29 | 2c0a | 0976 | 6172 | 6961 | 626c | 655f | 6e75 | 6d62 | 6572 | 2856 | 6172 | 2c20 | 4e29 | 2e0a | 0a25 |

```
2547440 2525 2520 6e65 7720 696e 7465 726d 6564 6961 7465 0a0a 6e65 775f 696e 7465 726d 6564 6961 7465 2856 6172 2c20 5061 7265
2547520 6e74 2920 3a2d 0a09 6e65 775f 636f 756e 7428 696e 7465 726d 6564 6961 7465 2c20 4e29 2c0a 0969 6e74 6572 6d65 6469 6174
2547600 655f 6e75 6d62 6572 2856 6172 2c20 4e29 2c0a 0969 6e74 6572 6d65 6469 6174 655f 7061 7265 6e74 2856 6172 2c20 5061 7265
2547660 6e74 292e 0a0a 2525 2525 2525 2525 2525 2525 2525 2525 2525 2525 2525 2525 2525 2525 2525 2525 2525 2525 2525 2525 2525
2547740 2525 2525 2525 2525 2525 2525 2525 2525 2525 2525 2525 2525 2525 2525 2525 2525 2525 2525 0a00 033b 0012 b88e 0000 017b
2550020 0012 b896 0000 0373 0012 b89e 0000 032b 0012 b8a6 0000 03bb 0012 b8ae 0000 0373 0012 b8b6 0000 032b 0012 b8be 0000 03bb
2550100 0012 b8c6 0000 017b 0012 b8ce 0000 03b3 0012 b8d6 0000 019b 0012 b8de 0000 0173 0012 b8e6 0000 018b 0012 b8ee 0000 017b
2550160 0012 b8f6 0000 039b 0012 b8fe 0000 03a3 0012 b906 0000 030b 0012 b90e 0000 031b 0012 b916 0000 035b 0012 b91e 0000 017b
2550240 0012 b936 0000 0343 0012 b93e 0000 037b 0012 b946 0000 036b 0012 b94e 0000 032b 0012 b956 0000 017b 0012 b95e 0000 037b
2550320 0012 b966 0000 039b 0012 b96e 0000 033b 0012 b976 0000 039b 0012 b97e 0000 018b 0012 b986 0000 017b 0012 b98e 0000 030b
2550400 0012 b996 0000 017b 0012 b99e 0000 03b3 0012 b9a6 0000 034b 0012 b9ae 0000 0353 0012 b9b6 0000 030b 0012 b9be 0000 03cb
2550460 0012 b9c6 0000 017b 0012 b9ce 0000 02b3 0012 b9d6 0000 0243 0012 b9de 0000 0223 0012 b9e6 0000 0263 0012 b9ee 0000 017b
2550540 0012 b9f6 0000 0383 0012 b9fe 0000 039b 0012 ba06 0000 0393 0012 ba0e 0000 039b 0012 ba16 0000 032b 0012 ba1e 0000 0393
2550620 0012 ba26 0000 017b 0012 ba2e 0000 0383 0012 ba36 0000 0393 0012 ba3e 0000 037b 0012 ba46 0000 0363 0012 ba4e 0000 037b
2550700 0012 ba56 0000 033b 0012 ba5e 0000 017b 0012 ba66 0000 0373 0012 ba6e 0000 032b 0012 ba76 0000 03bb 0012 ba7e 0000 0373
2550760 0012 ba86 0000 032b 0012 ba8e 0000 03bb 0012 ba96 0000 017b 0012 ba9e 0000 03b3 0012 baa6 0000 019b 0012 baae 0000 0173
2551040 0012 bab6 0000 018b 0012 babe 0000 017b 0012 bac6 0000 039b 0012 bace 0000 03a3 0012 bad6 0000 030b 0012 bade 0000 031b
2551120 0012 bae6 0000 035b 0012 b74e 0000 6307 0000 0007 0012 bb4d 0000 022b 0000 26ef 0000 1fc7 0500 26f7 0012 bb00 0012 bafc
2551200 0012 baf8 0012 baf4 0000 3807 0200 0db7 0012 bb05 0000 315f 0200 0db7 0012 bb35 0000 315f 0500 26f7 0000 1fc7 0000 26ef
2551260 0000 022b 0012 bb4d 0000 3807 0200 09cf 0000 c01b 0000 001b 0000 62c7 0000 0007 0000 030b 0012 bb6a 0000 0363 0012 bb72
2551340 0000 034b 0012 bb7a 0000 030b 2c78 0020 0002 438a 45b8 39a4 0012 0fa4 0010 41e8 0000 52b7 2420 0000 0012 10d0 0011 1ea0
2551420 0200 6767 0000 3287 0000 0008 0010 dff8 0010 dff8 c001 006b 0000 0000 0011 1ec0 0200 676f 0000 3287 0000 0008 0010 e7e8
2551500 0010 e7e8 0001 006b 0000 0000 0011 1ee0 0200 6777 0000 3287 0000 0008 0011 23d8 0011 23d8 0001 006b 0000 0000 0011 1f18
2551560 0200 677f 0000 3287 0000 0008 0010 e55c 0010 e55c 0001 006b 0000 0000 0011 2018 0200 67a7 0000 3287 0000 0008 000b 6688
2551640 000b 6688 0001 006b 0000 0000 0011 1f38 0200 6787 0000 3287 0000 0008 0011 27e0 0011 27e0 0001 006b 0000 0000 0011 1fb8
2551720 0200 678f 0000 3287 0000 0008 0011 2bb4 0011 2bb4 0001 006b 0000 0000 0011 1fd8 0200 6797 0000 3287 0000 0008 0011 2ca8
2552000 0011 2ca8 0001 006b 0000 0000 0010 656e 7469 7479 5f6f 7065 7261 746f 7273 00b2 0011 1ff8 0200 679f 0000 3287 0000 0008
2552060 0011 2dfc 0011 2dfc 0001 006b 0000 0000 0011 656e 7469 7479 5f61 7474 7269 6275 7465 7300 0019 656e 7469 7479 5f73 6f75
2552140 7263 655f 6c69 6e65 5f6e 756d 6265 7200 0011 2150 0200 67af 0000 3287 0000 0008 0011 2ec4 0011 2ec4 0001 006b 0000 0000
2552220 2c78 0020 0002 438a 45b8 39a4 0012 0fa4 0010 41e8 0000 5237 2420 0000 0012 10d0 0011 2170 0200 67b7 0000 3287 0000 0008
2552300 0011 2f5c 0011 2f5c 0001 006b 0000 0000 000f 6172 6368 6974 6563 7475 7265 5f69 6400 017b 0011 2190 0200 67bf 0000 3287
2552360 0000 0008 0011 3054 0011 3054 0001 006b 0000 0000 0011 6172 6368 6974 6563 7475 7265 5f74 7970 6500 0011 21b0 0200 67c7
2552440 0000 3287 0000 0008 0011 30c8 0011 30c8 0001 006b 0000 0000 0013 6172 6368 6974 6563 7475 7265 5f70 6172 656e 7400 bde2
2552520 0011 21d0 0200 67cf 0000 3287 0000 0008 0011 3268 0011 3268 0001 006b 0000 0000 0011 6172 6368 6974 6563 7475 7265 5f6e
2552600 616d 6500 0011 21f0 0200 67d7 0000 3287 0000 0008 0011 335c 0011 335c 0001 006b 0000 0000 0013 6172 6368 6974 6563 7475
2552660 7265 5f69 6e70 7574 7300 0393 0011 2210 0200 67df 0000 3287 0000 0008 0011 3440 0011 3440 0001 006b 0000 0000 0014 6172
2552740 6368 6974 6563 7475 7265 5f6f 7574 7075 7473 007b 0011 2230 0200 67e7 0000 3287 0000 0008 0011 34c0 0011 34c0 0001 006b
2553020 0000 0000 0016 6172 6368 6974 6563 7475 7265 5f6f 7065 7261 746f 7273 0012 bec2 0011 2250 0200 67ef 0000 3287 0000 0008
2553100 0011 36cc 0011 36cc 0001 006b 0000 0000 0017 6172 6368 6974 6563 7475 7265 5f61 7474 7269 6275 7465 7300 018b 0011 2270
2553160 0200 67f7 0000 3287 0000 0008 0011 3894 0011 3894 0001 006b 0000 0000 001f 6172 6368 6974 6563 7475 7265 5f73 6f75 7263
2553240 655f 6c69 6e65 5f6e 756d 6265 7200 bf42 0011 2290 0200 67ff 0000 3287 0000 0008 0011 3a8c 0011 3a8c 0001 006b 0000 0000
2553320 2c78 0020 0002 438a 45b8 39a4 0012 0fa4 0010 41e8 0000 52c7 2420 0000 0012 10d0 000f 6675 6e63 7469 6f6e 5f6e 756d 6265
2553400 7200 03cb 0011 22cc 0200 6807 0000 3287 0000 0008 0011 3dec 0011 3dec 0001 006b 0000 0000 0011 2350 0200 680f 0000 3287
2553460 0000 0008 0011 3f4c 0011 3f4c 0001 006b 0000 0000 0011 2380 0200 6817 0000 3287 0000 0008 0011 41b8 0011 41b8 0001 006b
2553540 0000 0000 000f 6675 6e63 7469 6f6e 5f70 6172 656e 7400 c00a 0011 23a0 0200 681f 0000 3287 0000 0008 0011 4284 0011 4284
2553620 0001 006b 0000 0000 0011 2408 0200 6827 0000 3287 0000 0008 0011 4600 0011 4600 0001 006b 0000 0000 000f 6675 6e63 7469
2553700 6f6e 5f69 6e70 7574 7300 032b 0011 2454 0200 682f 0000 3287 0000 0008 0011 489c 0011 489c 0001 006b 0000 0000 0010 6675
2553760 6e63 7469 6f6e 5f6f 7574 7075 7473 0092 0011 2474 0200 6837 0000 3287 0000 0008 0011 4bd4 0011 4bd4 0001 006b 0000 0000
2554040 0012 6675 6e63 7469 6f6e 5f6f 7065 7261 746f 7273 0012 c0ca 0011 251c 0200 683f 0000 3287 0000 0008 0011 4e04 0011 4e04
2554120 0001 006b 0000 0000 0013 6675 6e63 7469 6f6e 5f61 7474 7269 6275 7465 7300 c0f2 0011 254c 0200 6847 0000 3287 0000 0008
2554200 0011 4f90 0011 4f90 0001 006b 0000 0000 001b 6675 6e63 7469 6f6e 5f73 6f75 7263 655f 6c69 6e65 5f6e 756d 6265 7200 c132
2554260 0011 256c 0200 684f 0000 3287 0000 0008 0011 5004 0011 5004 0001 006b 0000 0000 2c78 0020 0002 438a 45b8 39a4 0012 0fa4
2554340 0010 41e8 0000 533f 2420 0000 0012 1010 0010 7072 6f63 6564 7572 655f 6e75 6d62 6572 00b3 0011 25b8 0200 6857 0000 3287
2554420 0000 0008 0011 54b8 0011 54b8 0001 006b 0000 0000 0011 25d8 0200 685f 0000 3287 0000 0008 0011 5650 0011 5650 0001 006b
2554500 0000 0000 000e 7072 6f63 6564 7572 655f 7479 7065 0012 c1da 0011 665c 0200 6867 0000 3287 0000 0008 0011 580c 0011 580c
```

| | | | | | | | | | | | | | | | | | | | | | | | | |
|---|---|---|---|---|---|---|---|---|---|---|---|---|---|---|---|---|---|---|---|---|---|---|---|---|
| 2554560 | 0001 | 006b | 0000 | 0000 | 0010 | 7072 | 6f63 | 6564 | 7572 | 655f | 7061 | 7265 | 6e74 | 003b | 0011 | 2680 | 0200 | 686f | 0000 | 3287 | 0000 | 0008 | 0012 | c24c |
| 2554640 | 0012 | c24c | 0001 | 006b | 0000 | 0000 | 0000 | 1e37 | b328 | 0373 | 0012 | a900 | 0000 | 0000 | 2c78 | 0010 | 0002 | 438a | 239c | 0000 | 0012 | 0fc4 | 000e | 7072 |
| 2554720 | 6f63 | 6564 | 7572 | 655f | 6e61 | 6d65 | 0012 | c262 | 0011 | 26c8 | 0200 | 6877 | 0000 | 3287 | 0000 | 0008 | 0012 | c2a0 | 0012 | c2a0 | 0001 | 006b | 0000 | 0000 |
| 2555000 | 0000 | 1e37 | b328 | c28a | 0012 | a8d4 | 0000 | 0000 | 2c78 | 0010 | 0002 | 438a | 239c | 0000 | 0012 | 1218 | 0010 | 7072 | 6f63 | 6564 | 7572 | 655f | 696e | 7075 |
| 2555060 | 7473 | 007b | 0011 | 26f8 | 0200 | 687f | 0000 | 3287 | 0000 | 0008 | 0012 | c2f4 | 0012 | c2f4 | 0001 | 006b | 0000 | 0000 | 0000 | 6a37 | b328 | 0000 | 0012 | a868 |
| 2555140 | 0000 | 0000 | 2c78 | 0010 | 0002 | 438a | 239c | 0000 | 0012 | 35f0 | 0011 | 7072 | 6f63 | 6564 | 7572 | 655f | 6f75 | 7470 | 7574 | 7300 | 0011 | 34a0 | 0200 | 6887 |
| 2555220 | 0000 | 3287 | 0000 | 0008 | 0012 | c348 | 0012 | c348 | 0001 | 006b | 0000 | 0000 | 2c78 | 0010 | 0002 | 438a | 239c | 0000 | 0013 | 12dc | 2c78 | 0010 | 0002 | 438a |
| 2555300 | 239c | 0000 | 0012 | 3654 | 0013 | 7072 | 6f63 | 6564 | 7572 | 655f | 6f70 | 6572 | 6174 | 6f72 | 7300 | c372 | 0011 | 2790 | 0200 | 688f | 0000 | 3287 | 0000 | 0008 |
| 2555360 | 0012 | c3a0 | 0012 | c3a0 | 0001 | 006b | 0000 | 0000 | 0000 | 6a37 | b328 | c39a | 0012 | a810 | 0000 | 0000 | 2c78 | 0010 | 0002 | 438a | 239c | 0000 | 0012 | 36d4 |
| 2555440 | 0014 | 7072 | 6f63 | 6564 | 7572 | 655f | 6174 | 7472 | 6962 | 7574 | 6573 | 00ca | 0011 | 27c0 | 0200 | 6897 | 0000 | 3287 | 0000 | 0008 | 0012 | c3f8 | 0012 | c3f8 |
| 2555520 | 0001 | 006b | 0000 | 0000 | 000d | 6578 | 6973 | 7473 | 5f64 | 6573 | 6967 | 6e00 | 2c78 | 0010 | 0002 | 438a | 239c | 0000 | 0012 | 3894 | 001c | 7072 | 6f63 | 6564 |
| 2555600 | 7572 | 655f | 736f | 7572 | 6365 | 5f6c | 696e | 655f | 6e75 | 6d62 | 6572 | 002a | 0011 | 2834 | 0200 | 689f | 0000 | 3287 | 0000 | 0008 | 0012 | c458 | 0012 | c458 |
| 2555660 | 0001 | 006b | 0000 | 0000 | 0000 | 6acf | b328 | 0000 | 0012 | cda8 | 0000 | 0000 | 2c78 | 0010 | 0002 | 438a | 239c | 0000 | 0012 | 3a08 | 000a | 6d73 | 745f | 746f |
| 2555740 | 5f6d | 7366 | 0000 | 0000 | 2c78 | 0020 | 0002 | 438a | 45b8 | 39a4 | 0012 | 0fa4 | 0010 | 41e8 | 0000 | 5347 | 2420 | 0000 | 0012 | 10d0 | 000e | 7072 | 6f63 | 6573 |
| 2556020 | 735f | 6e75 | 6d62 | 6572 | 0019 | 6b03 | 0011 | 289c | 0200 | 68a7 | 0000 | 3287 | 0000 | 0008 | 0012 | c4dc | 0012 | c4dc | 0001 | 006b | 0000 | 0000 | 000d | 666f |
| 2556100 | 726d | 5f63 | 6c75 | 7374 | 6572 | 7300 | 2c78 | 0010 | 0002 | 438a | 239c | 0000 | 0012 | 3a80 | 000b | 7265 | 616c | 5f69 | 6e70 | 7574 | 7300 | 0000 | 2c78 | 0010 |
| 2556160 | 0002 | 438a | 239c | 0000 | 0012 | 0fe4 | 000c | 7072 | 6f63 | 6573 | 735f | 7479 | 7065 | 007b | 0011 | 28cc | 0200 | 68af | 0000 | 3287 | 0000 | 0008 | 0012 | c54c |
| 2556240 | 0012 | c54c | 0001 | 006b | 0000 | 0000 | 27f0 | 000e | 0012 | d288 | 54a8 | 54f8 | 228c | 0000 | 2c78 | 0010 | 0002 | 438a | 239c | 0000 | 0012 | 10d0 | 000e | 7072 |
| 2556320 | 6f63 | 6573 | 735f | 7061 | 7265 | 6e74 | 0012 | c572 | 0011 | 2910 | 0200 | 68b7 | 0000 | 3287 | 0000 | 0008 | 0012 | c5a0 | 0012 | c5a0 | 0001 | 006b | 0000 | 0000 |
| 2556400 | 0000 | 6adf | b328 | c688 | 0013 | 38ac | 0000 | 0000 | 2c78 | 0010 | 0002 | 438a | 239c | 0000 | 0012 | 0fc4 | 000c | 7072 | 6f63 | 6573 | 735f | 6e61 | 6d65 | 00c2 |
| 2556460 | 0010 | a494 | 0200 | 68bf | 0000 | 3287 | 0000 | 0008 | 0012 | c5f0 | 0012 | c5f0 | 0001 | 006b | 0000 | 0000 | 0000 | 6d27 | b328 | c5ea | 0013 | c908 | 0000 | 0000 |
| 2556540 | 2c78 | 0010 | 0002 | 438a | 239c | 0000 | 0012 | 1218 | 000e | 7072 | 6f63 | 6573 | 735f | 696e | 7075 | 7473 | 0000 | 03bb | 0011 | 2988 | 0200 | 68c7 | 0000 | 3287 |
| 2556620 | 0000 | 0008 | 0012 | c644 | 0012 | c644 | 0001 | 006b | 0000 | 0000 | 0000 | 6d27 | b328 | 018b | 0013 | c8dc | 0000 | 0000 | 2c78 | 0010 | 0002 | 438a | 239c | 0000 |
| 2556700 | 0012 | 35f0 | 000f | 7072 | 6f63 | 6573 | 735f | 6f75 | 7470 | 7574 | 7300 | c66a | 0011 | 29c8 | 0200 | 68cf | 0000 | 3287 | 0000 | 0008 | 0012 | c698 | 0012 | c698 |
| 2556760 | 0001 | 006b | 0000 | 0000 | 0000 | 6adf | b328 | c692 | 0013 | 3880 | 0000 | 0000 | 2c78 | 0010 | 0002 | 438a | 239c | 0000 | 0012 | 3654 | 000a | 636c | 7573 | 7465 |
| 2557040 | 722e | 706c | 0000 | 0000 | 2c78 | 0010 | 0002 | 438a | 239c | 0000 | 0012 | 36d4 | 0012 | 7072 | 6f63 | 6573 | 735f | 6174 | 7472 | 6962 | 7574 | 6573 | 0000 | 0343 |
| 2557120 | 0011 | 29f8 | 0200 | 68d7 | 0000 | 3287 | 0000 | 0008 | 0012 | c710 | 0012 | c710 | 0001 | 006b | 0000 | 0000 | 000c | 7075 | 7464 | 625f | 6465 | 7369 | 676e | 0000 |
| 2557200 | 2c78 | 0010 | 0002 | 438a | 239c | 0000 | 0012 | 3894 | 001a | 7072 | 6f63 | 6573 | 735f | 736f | 7572 | 6365 | 5f6c | 696e | 655f | 6e75 | 6d62 | 6572 | 0000 | 017b |
| 2557260 | 0011 | 2a38 | 0200 | 68df | 0000 | 3287 | 0000 | 0008 | 0012 | c770 | 0012 | c770 | 0001 | 006b | 0000 | 0000 | 000c | 696e | 636f | 6d70 | 6174 | 6962 | 6c65 | 0000 |
| 2557340 | 2c78 | 0010 | 0002 | 438a | 239c | 0000 | 0012 | 3a08 | 2c78 | 0010 | 0002 | 438a | 239c | 0000 | 0014 | 5454 | 2c78 | 0020 | 0002 | 438a | 45b8 | 39a4 | 0012 | 0fa4 |
| 2557420 | 0010 | 41e8 | 0000 | 53e7 | 2420 | 0000 | 0012 | 10d0 | 0011 | 7374 | 6174 | 6562 | 6c6f | 636b | 5f6e | 756d | 6265 | 7200 | 0011 | 2a94 | 0200 | 68e7 | 0000 | 3287 |
| 2557500 | 0000 | 0008 | 0012 | c7f4 | 0012 | c7f4 | 0001 | 006b | 0000 | 0000 | 2c78 | 0010 | 0002 | 438a | 239c | 0000 | 0012 | ee08 | 2c78 | 0010 | 0002 | 438a | 239c | 0000 |
| 2557560 | 0012 | 3a80 | 000a | 6d69 | 6e5f | 6d65 | 6d62 | 6572 | 0000 | 0000 | 2c78 | 0010 | 0002 | 438a | 239c | 0000 | 0012 | 0fe4 | 000f | 7374 | 6174 | 6562 | 6c6f | 636b |
| 2557640 | 5f74 | 7970 | 6500 | 03bb | 0011 | 2ab4 | 0200 | 68ef | 0000 | 3287 | 0000 | 0008 | 0012 | c868 | 0012 | c868 | 0001 | 006b | 0000 | 0000 | 2c78 | 0010 | 0002 | 438a |
| 2557720 | 239c | 0000 | 0014 | 548c | 2c78 | 0010 | 0002 | 438a | 239c | 0000 | 0012 | 10d0 | 0011 | 7374 | 6174 | 6562 | 6c6f | 636b | 5f70 | 6172 | 656e | 7400 | 0011 | 2af0 |
| 2560000 | 0200 | 68f7 | 0000 | 3287 | 0000 | 0008 | 0012 | c8bc | 0012 | c8bc | 0001 | 006b | 0000 | 0000 | 0000 | 6e5f | b328 | 000b | 0013 | ea04 | 0000 | 0000 | 2c78 | 0010 |
| 2560060 | 0002 | 438a | 239c | 0000 | 0012 | 0fc4 | 000f | 7374 | 6174 | 6562 | 6c6f | 636b | 5f6e | 616d | 6500 | 15af | 0011 | 2b94 | 0200 | 68ff | 0000 | 3287 | 0000 | 0008 |
| 2560140 | 0012 | c910 | 0012 | c910 | 0001 | 006b | 0000 | 0000 | 000d | 7374 | 7269 | 6e67 | 5f6c | 656e | 6774 | 6800 | 2c78 | 0010 | 0002 | 438a | 239c | 0000 | 0012 | 1218 |
| 2560220 | 0011 | 7374 | 6174 | 6562 | 6c6f | 636b | 5f69 | 6e70 | 7574 | 7300 | 0011 | 2c2c | 0200 | 6907 | 0000 | 3287 | 0000 | 0008 | 0012 | c964 | 0012 | c964 | 0001 | 006b |
| 2560300 | 0000 | 0000 | 0014 | 0d30 | 0014 | 0d68 | 0014 | 0d7c | 0014 | 0d90 | 2c78 | 0010 | 0002 | 438a | 239c | 0000 | 0012 | 35f0 | 0012 | 7374 | 6174 | 6562 | 6c6f | 636b |
| 2560360 | 5f6f | 7574 | 7075 | 7473 | 0000 | 037b | 0011 | 2c4c | 0200 | 690f | 0000 | 3287 | 0000 | 0008 | 0012 | c9bc | 0012 | c9bc | 0001 | 006b | 0000 | 0000 | 0000 | 6c4f |
| 2560440 | b328 | 017b | 0013 | a724 | 0000 | 0000 | 2c78 | 0010 | 0002 | 438a | 239c | 0000 | 0012 | 3654 | 000d | 636f | 6e74 | 726f | 6c5f | 7374 | 6570 | 7300 | 2c78 | 0010 |
| 2560520 | 0002 | 438a | 239c | 0000 | 0012 | 36d4 | 0015 | 7374 | 6174 | 6562 | 6c6f | 636b | 5f61 | 7474 | 7269 | 6275 | 7465 | 7300 | 0011 | 2c6c | 0200 | 6917 | 0000 | 3287 |
| 2560600 | 0000 | 0008 | 0012 | ca34 | 0012 | ca34 | 0001 | 006b | 0000 | 0000 | 000d | 6275 | 645f | 6469 | 7374 | 616e | 6365 | 3200 | 2c78 | 0010 | 0002 | 438a | 239c | 0000 |
| 2560660 | 0012 | 3894 | 001d | 7374 | 6174 | 6562 | 6c6f | 636b | 5f73 | 6f75 | 7263 | 655f | 6c69 | 6e65 | 5f6e | 756d | 6265 | 7200 | 0011 | 2cd8 | 0200 | 691f | 0000 | 3287 |
| 2560740 | 0000 | 0008 | 0012 | ca94 | 0012 | ca94 | 0001 | 006b | 0000 | 0000 | 2c78 | 0010 | 0002 | 438a | 35ec | 22bc | 0012 | ec28 | 2c78 | 0010 | 0002 | 438a | 239c | 0000 |
| 2561020 | 0012 | 3a08 | 000c | 6469 | 7374 | 616e | 6365 | 5f61 | 7578 | 0000 | 000a | 6e75 | 6c6c | 7061 | 7265 | 6e74 | 0000 | 017b | 000b | 7374 | 7269 | 6e67 | 5f73 | 697a |
| 2561100 | 6500 | 0000 | 000d | 616c | 6170 | 5f73 | 6368 | 6564 | 756c | 6500 | 000c | 6e65 | 775f | 6675 | 6e63 | 7469 | 6f6e | 0023 | 0011 | 2d68 | 0200 | 692f | 0000 | 3287 |
| 2561160 | 0000 | 0008 | 0012 | 8cc4 | 0012 | 8cc4 | 0001 | 006b | 0000 | 0000 | 000c | 6275 | 645f | 6469 | 7374 | 616e | 6365 | 0000 | 000d | 6e65 | 775f | 7072 | 6f63 | 6564 |
| 2561240 | 7572 | 6500 | 0011 | 2d98 | 0200 | 6937 | 0000 | 3287 | 0000 | 0008 | 0012 | 8d54 | 0012 | 8d54 | 0001 | 006b | 0000 | 0000 | 000d | 6173 | 6170 | 5f73 | 6368 | 6564 |
| 2561320 | 756c | 6500 | 0000 | 6757 | b328 | 0363 | 0012 | 9c5c | 0000 | 0000 | 0000 | 6957 | b328 | 017b | 0012 | 9c30 | 0000 | 0000 | 000a | 616c | 6961 | 7365 | 732e | 706c |
| 2561400 | 0000 | 0000 | 2c78 | 0024 | 0002 | 438a | 45b8 | 332c | 4300 | 0000 | 0000 | 32e7 | 0011 | be4c | 0014 | 3d30 | 2420 | 0000 | 0012 | 44e4 | 0012 | cde0 | 0000 | 002c |
| 2561460 | b288 | b66c | 0000 | 0cfe | 7fff | ffff | 0013 | 387c | 0200 | 0db5 | 0100 | 15ad | 0100 | 33fd | 0000 | 000b | 0000 | 315f | 003a | 2f68 | 6f6d | 652f | 6f73 | 6173 |
| 2561540 | 312f | 612f | 7669 | 6a61 | 792f | 5648 | 444c | 2f70 | 6172 | 7365 | 722f | 7072 | 6f6c | 6f67 | 2f6e | 6577 | 6e65 | 772f | 7633 | 2e31 | 2f63 | 6c75 | 7374 | 6572 |
| 2561620 | 0063 | 6174 | 003d | 2f68 | 6f6d | 652f | 6f73 | 6173 | 312f | 612f | 7669 | 6a61 | 792f | 5648 | 444c | 2f70 | 6172 | 7365 | 722f | 7072 | 6f6c | 6f67 | 2f6e | 6577 |

```
2561700 6e65 772f 7633 2e31 2f63 6c75 7374 6572 2e70 6c00 0042 2f68 6f6d 652f 6f73 6173 312f 612f 7669 6a61 792f 5648 444c 2f70
2561760 6172 7365 722f 7072 6f6c 6f67 2f6e 6577 6e65 772f 7633 2e31 2f63 6c75 7374 6572 5f73 7570 706f 7274 006c 5f73 0045 2f68
2562040 6f6d 652f 6f73 6173 312f 612f 7669 6a61 792f 5648 444c 2f70 6172 7365 722f 7072 6f6c 6f67 2f6e 6577 6e65 772f 7633 2e31
2562120 2f63 6c75 7374 6572 5f73 7570 706f 7274 2e70 6c00 0038 2f68 6f6d 652f 6f73 6173 312f 612f 7669 6a61 792f 5648 444c 2f70
2562200 6172 7365 722f 7072 6f6c 6f67 2f6e 6577 6e65 772f 7633 2e31 2f66 636f 7374 0063 003b 2f68 6f6d 652f 6f73 6173 312f 612f
2562260 7669 6a61 792f 5648 444c 2f70 6172 7365 722f 7072 6f6c 6f67 2f6e 6577 6e65 772f 7633 2e31 2f66 636f 7374 2e70 6c00 7042
2562340 0000 002c 0013 397c b27c b66c 0000 0d01 7fff ffff 0012 a80c 0200 0db5 0200 2f35 0000 6acf 0000 0373 0000 315f 0000 002c
2562420 0013 38a8 b27c b66c 0000 0d11 7fff ffff 0012 9c58 0200 0db5 0200 224d 0000 6acf 0000 3287 0000 315f 000e 7075 7464 625f
2562500 636c 7573 7465 7273 0000 0000 0012 d06c 0000 0230 b27c b66c 0000 0d03 0000 0d10 000a d16d 0200 0db5 0200 270d 0000 6acf
2562560 0000 3287 0000 315f 0012 ce40 0000 0034 b288 b66c 0000 0d04 7fff ffff 0013 788c 0200 0db5 0100 15ad 0100 33fd 0200 0b3d
2562640 0000 1d37 0000 0013 0000 315f 0012 ce74 0000 0034 b298 b66c 0000 0d04 7fff ffff 0012 ce10 0200 0db5 0100 15ad 0100 33fd
2562720 0200 0b3d 0000 1ea7 0000 0013 0000 315f 0012 cea8 0000 0034 b288 b66c 0000 0d04 7fff ffff 0012 ce44 0200 0db5 0100 15ad
2563000 0100 33fd 0200 0b3d 0000 1ea7 0000 001b 0000 315f 0012 cedc 0000 0034 b288 b66c 0000 0d04 7fff ffff 0012 ce78 0200 0db5
2563060 0100 15ad 0100 33fd 0200 0b3d 0000 1ea7 0000 0023 0000 315f 0012 cf10 0000 0034 b288 b66c 0000 0d04 7fff ffff 0012 ceac
2563140 0200 0db5 0100 15ad 0100 33fd 0200 0b3d 0000 1ea7 0000 002b 0000 315f 0012 cf44 0000 0034 b288 b66c 0000 0d04 7fff ffff
2563220 0012 cee0 0200 0db5 0100 15ad 0100 33fd 0200 0b3d 0000 1ea7 0000 0033 0000 315f 0012 cf78 0000 0034 b288 b66c 0000 0d04
2563300 7fff ffff 0012 cf14 0200 0db5 0100 15ad 0100 33fd 0200 0b3d 0000 1ea7 0000 003b 0000 315f 0012 cfac 0000 0034 b288 b66c
2563360 0000 0d04 7fff ffff 0012 cf48 0200 0db5 0100 15ad 0100 33fd 0200 0b3d 0000 2fe7 0000 0023 0000 315f 0012 cfe4 0000 0038
2563440 b27c b66c 0000 0d05 0000 0d12 0012 d070 0200 0db5 0500 1cdd 0000 6af7 0000 001b 0000 3287 009b c643 0000 0373 0000 315f
2563520 0012 d06c 0000 002c b4f0 b4e4 0000 0d04 7fff ffff 0008 b0dd 0000 0000 0000 0000 0012 d3ac 0002 438a 0011 25b4 2c78 005c
2563600 0002 438a 45e8 0024 4700 477c 34a0 001c 3228 3804 3af4 0024 0010 1990 0028 3380 0020 3c9c 0000 0024 0013 78e8 0024 33bc
2563660 3e70 0020 40b4 001c 000d d784 001c 33a0 3804 39f8 0013 7908 001c 38e8 386c 3d30 3cf4 234c 0013 7928 0012 d0d0 0000 0038
2563740 b27c b66c 0000 0d06 0000 0d13 0012 d044 0200 0db5 0500 1cdd 0000 6b0f 0000 0023 0000 3287 009b c943 0000 0373 0000 315f
2564020 2954 002c 0002 438a 56f8 671c 682c 46ec 4768 5818 67b8 6aa0 362c 3804 3ba0 0000 0013 7994 001c 2304 0013 7928 0012 d1c8
2564100 0000 00a8 b27c b66c 0000 0d07 0000 0d14 0012 d10c 0200 0db5 0500 1cdd 0000 6b17 0000 0023 0000 3287 009b cca3 0000 0373
2564160 0000 315f 0012 d140 0000 0038 b27c b66c 0000 0d08 0000 0d15 0012 d144 0200 0db5 0500 1cdd 0000 6b07 0000 001b 0000 3287
2564240 009b c843 0000 0373 0000 315f 0012 d1c8 0000 0038 b27c b66c 0000 0d09 0000 0d16 0012 d1cc 0200 0db5 0500 1cdd 0000 6b07
2564320 0000 0023 0000 3287 009b d143 0000 0373 0000 315f 2954 0050 0002 438a 56f8 671c 682c 5aec 0200 0ad7 6110 0018 46ec 4790
2564400 001c 47e4 3050 34a0 0020 3678 0018 35c8 3ba0 0000 0013 7a80 0024 33d8 3e70 0020 3af4 001c 0011 3c44 001c 38e8 3d6c 2330
2564460 0013 7a28 0012 d254 0000 0038 b27c b66c 0000 0d0a 0000 0d17 0012 d258 0200 0db5 0500 1cdd 0000 6b27 0000 0013 0000 3287
2564540 009b cfa3 0000 0373 0000 315f 2954 0054 0002 438a 45e8 001c 4700 332c 3af4 001c 000f d530 0024 3380 0020 3c9c 0000 001c
2564620 000f d440 0024 33f4 3e70 0020 3af4 001c 000d d784 001c 3310 4108 0000 000f d2c0 0018 386c 3d30 3cf4 242c 0000 0013 7af8
2564700 0012 d2e0 0000 0038 b27c b66c 0000 0d0b 0000 0d18 0012 d2e4 0200 0db5 0500 1cdd 0000 6b27 0000 001b 0000 3287 009b d7c3
2564760 0000 0373 0000 315f 2954 0054 0002 438a 45b8 4714 57b8 6af0 001c 6a50 3228 3818 32f0 0020 24d0 0000 000d d604 0024 2ecc
2565040 3894 001c 37dc 411c 0000 0020 000f d4d0 0020 33bc 382c 001c 3c48 0000 000d d6f4 0018 386c 3d30 2340 0013 7af8 0012 d370
2565120 0000 0038 b27c b66c 0000 0d0c 0000 0d19 0012 d374 0200 0db5 0500 1cdd 0000 6b1f 0000 0023 0000 3287 009b cea3 0000 0373
2565200 0000 315f 28c4 0058 0013 7b40 56f8 671c 682c 5aec 0200 0ad7 6110 0018 46ec 4768 5818 6750 6aa0 5b58 0200 0ad7 6b74 6c84
2565260 0018 34a0 001c 3678 0018 35c8 3ba0 0000 0013 7a80 0020 3804 3df4 001c 8d94 aab4 0000 a538 2ecc 2304 0013 79d4 0012 f2c8
2565340 0000 1854 b27c b66c 0000 0d0d 0000 0d1a 0012 d3ac 0200 0db5 0500 1cdd 0000 504f 0000 0023 0000 3287 009b d403 0000 0373
2565420 0000 315f 0012 d3e0 0000 0038 b130 b66c 0000 0d0e 0000 0d1b 0012 cfe9 0200 0db5 0500 1cdd 0000 6aff 0000 0013 0000 3287
2565500 009b c743 0000 0373 0000 315f 0012 f2c8 0000 17e4 6865 6e20 7365 6c65 6374 2061 6e6f 7468 6572 206f 6e65 2066 726f 6d20
2565560 7468 6520 6c69 7374 2e20 4966 0a25 2520 616c 6c20 7468 6520 6f70 6572 6174 6f72 7320 696e 2074 6865 206c 6973 7420 6361
2565640 6e6e 6f74 2062 6520 7363 6865 6475 6c65 6420 696e 2074 6865 2063 7572 7265 6e74 2063 6f6e 7472 6f6c 0a25 2520 7374 6570
2565720 2074 6865 6e20 7472 7920 7363 6865 6475 6c69 6e67 2074 6865 6d20 696e 2074 6865 206e 6578 7420 636f 6e74 726f 6c20 7374
2566000 6570 2e0a 0a73 6368 6564 756c 655f 6173 6170 5f6f 7065 7261 746f 7273 284c 6973 742c 204e 756d 4373 7465 7073 2920 3a2d
2566060 0a09 7363 6865 6475 6c65 5f61 7361 705f 6f70 6572 6174 6f72 7328 4c69 7374 2c20 312c 204e 756d 4373 7465 7073 292e 090a
2566140 0a73 6368 6564 756c 655f 6173 6170 5f6f 7065 7261 746f 7273 285b 5d2c 2043 5374 6570 2c20 4353 7465 7029 203a 2d20 212e
2566220 0a73 6368 6564 756c 655f 6173 6170 5f6f 7065 7261 746f 7273 284c 6973 742c 2043 5374 6570 2c20 4e75 6d43 5374 6570 7329
2566300 203a 2d0a 0928 0a09 2020 2020 7365 6c65 6374 284f 7065 7261 746f 722c 204c 6973 742c 2052 6573 7429 2c0a 0920 2020 2073
2566360 6368 6564 756c 655f 6173 6170 5f6f 7065 7261 746f 7228 4f70 6572 6174 6f72 2c20 4353 7465 7029 2c0a 0920 2020 2073 6368
2566440 6564 756c 655f 6173 6170 5f6f 7065 7261 746f 7273 2852 6573 742c 2043 5374 6570 2c20 4e75 6d43 5374 6570 7329 2c20 210a
2566520 093b 0a09 2020 2020 4e65 7874 4353 7465 7020 6973 2043 5374 6570 202b 2031 2c0a 0920 2020 2073 6368 6564 756c 655f 6173
2566600 6170 5f6f 7065 7261 746f 7273 284c 6973 742c 204e 6578 7443 5374 6570 2c20 4e75 6d43 5374 6570 7329 0a09 292e 0a0a 2525
2566660 2043 616e 2073 6368 6564 756c 6520 6f70 6572 6174 6f72 2069 6620 7468 6572 6520 6973 206e 6f20 7761 7920 796f 7520 6361
2566740 6e6e 6f74 2073 6368 6564 756c 6520 6974 2e0a 0a73 6368 6564 756c 655f 6173 6170 5f6f 7065 7261 746f 7228 4f70 6572 6174
```

| | | | | | | | | | | | | | | | | | | | | | | | | |
|---|---|---|---|---|---|---|---|---|---|---|---|---|---|---|---|---|---|---|---|---|---|---|---|---|
| 2567020 | 6f72 | 2c20 | 4353 | 7465 | 7029 | 203a | 2d0a | 095c | 2b20 | 6361 | 6e6e | 6f74 | 5f73 | 6368 | 6564 | 756c | 655f | 6173 | 6170 | 5f6f | 7065 | 7261 | 746f | 7228 |
| 2567100 | 4f70 | 6572 | 6174 | 6f72 | 2c20 | 4353 | 7465 | 7029 | 2c0a | 0970 | 7574 | 6462 | 5f61 | 7361 | 705f | 7363 | 6865 | 6475 | 6c65 | 284f | 7065 | 7261 | 746f | 722c |
| 2567160 | 2043 | 5374 | 6570 | 292e | 0a0a | 2525 | 2043 | 616e | 6e6f | 7420 | 7363 | 6865 | 6475 | 6c65 | 204f | 7065 | 7261 | 746f | 7220 | 6966 | 2074 | 6865 | 7265 | 2065 |
| 2567240 | 7869 | 7374 | 7320 | 6174 | 206c | 6561 | 7374 | 206f | 6e65 | 204f | 700a | 2525 | 2070 | 7265 | 6365 | 6564 | 696e | 6720 | 4f70 | 6572 | 6174 | 6f72 | 2077 | 6869 |
| 2567320 | 6368 | 2069 | 7320 | 6e6f | 7420 | 7363 | 6865 | 6475 | 6c65 | 642e | 0a0a | 6361 | 6e6e | 6f74 | 5f73 | 6368 | 6564 | 756c | 655f | 6173 | 6170 | 5f6f | 7065 | 7261 |
| 2567400 | 746f | 7228 | 4f70 | 6572 | 6174 | 6f72 | 2c20 | 4353 | 7465 | 7029 | 203a | 2d0a | 0970 | 7265 | 6365 | 6465 | 735f | 696d | 6d65 | 6469 | 6174 | 6528 | 4f70 | 2c20 |
| 2567460 | 4f70 | 6572 | 6174 | 6f72 | 292c | 0a09 | 5c2b | 2073 | 6368 | 6564 | 756c | 6564 | 5f61 | 7361 | 7028 | 4f70 | 2c20 | 4353 | 7465 | 7029 | 2e0a | 090a | 2525 | 2041 |
| 2567540 | 6e20 | 6f70 | 6572 | 6174 | 6f72 | 2068 | 6173 | 2062 | 6565 | 6e20 | 7363 | 6865 | 6475 | 6c65 | 6420 | 6173 | 6170 | 0a0a | 7363 | 6865 | 6475 | 6c65 | 645f | 6173 |
| 2567620 | 6170 | 284f | 702c | 2043 | 5374 | 6570 | 2920 | 3a2d | 0a09 | 6f70 | 6572 | 6174 | 6f72 | 5f69 | 6428 | 4f70 | 2c20 | 4f70 | 4964 | 292c | 0a09 | 6578 | 6973 | 7473 |
| 2567700 | 5f61 | 7361 | 705f | 7363 | 6865 | 6475 | 6c65 | 284f | 7049 | 642c | 2043 | 5374 | 6570 | 4265 | 6769 | 6e2c | 2043 | 5374 | 6570 | 456e | 6429 | 2c20 | 212c | 0a09 |
| 2567760 | 4353 | 7465 | 7042 | 6567 | 696e | 203c | 2043 | 5374 | 6570 | 2c0a | 0943 | 5374 | 6570 | 456e | 6420 | 3c20 | 4353 | 7465 | 702e | 0a0a | 2525 | 2044 | 6174 | 6162 |
| 2570040 | 6173 | 6520 | 6163 | 6365 | 7373 | 0a0a | 7075 | 7464 | 625f | 6173 | 6170 | 5f73 | 6368 | 6564 | 756c | 6528 | 4f70 | 2c20 | 4353 | 7465 | 7029 | 203a | 2d0a | 096f |
| 2570120 | 7065 | 7261 | 746f | 725f | 6964 | 284f | 702c | 204f | 7049 | 6429 | 2c0a | 0a09 | 6f70 | 6572 | 6174 | 6f72 | 5f6e | 756d | 6265 | 7228 | 4f70 | 2c20 | 4e29 | 2c20 |
| 2570200 | 2020 | 2020 | 2020 | 2020 | 2020 | 2020 | 2020 | 2025 | 2066 | 6f72 | 2064 | 6562 | 7567 | 6769 | 6e67 | 2070 | 7572 | 706f | 7365 | 7320 | 6f6e | 6c79 | 0a09 | 666f |
| 2570260 | 726d | 6174 | 2827 | 4f70 | 6572 | 6174 | 6f72 | 207e | 642c | 2043 | 6f6e | 7472 | 6f6c | 2053 | 7465 | 7020 | 7e64 | 7e6e | 272c | 5b4e | 2c43 | 5374 | 6570 | 5d29 |
| 2570340 | 2c0a | 0a09 | 7075 | 7464 | 6228 | 6173 | 6170 | 5f73 | 6368 | 6564 | 756c | 6528 | 4f70 | 4964 | 2c20 | 4353 | 7465 | 702c | 2043 | 5374 | 6570 | 2929 | 2e0a | 0a65 |
| 2570420 | 7869 | 7374 | 735f | 6173 | 6170 | 5f73 | 6368 | 6564 | 756c | 6528 | 4f70 | 4964 | 2c20 | 4353 | 7465 | 7042 | 6567 | 696e | 2c20 | 4353 | 7465 | 7045 | 6e64 | 2920 |
| 2570500 | 3a2d | 0a09 | 6765 | 7464 | 6228 | 6173 | 6170 | 5f73 | 6368 | 6564 | 756c | 6528 | 4f70 | 4964 | 2c20 | 4353 | 7465 | 7042 | 6567 | 696e | 2c20 | 4353 | 7465 | 7045 |
| 2570560 | 6e64 | 2929 | 2e0a | 0a25 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 2570640 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 250a | 2525 | 2525 | 2041 | 4c41 | 5020 |
| 2570720 | 5363 | 6865 | 6475 | 6c69 | 6e67 | 206f | 6620 | 6f70 | 6572 | 6174 | 696f | 6e73 | 0a0a | 2525 | 2053 | 6368 | 6564 | 756c | 6573 | 2061 | 6c6c | 2074 | 6865 | 206f |
| 2571000 | 7065 | 7261 | 746f | 7273 | 2062 | 656c | 6f6e | 6769 | 6e67 | 2074 | 6f20 | 5072 | 6f63 | 426f | 6479 | 2e0a | 0a73 | 6368 | 6564 | 756c | 655f | 616c | 6170 | 5f70 |
| 2571060 | 726f | 6362 | 6f64 | 7928 | 5072 | 6f63 | 426f | 6479 | 2c20 | 4e75 | 6d43 | 5374 | 6570 | 7329 | 203a | 2d0a | 0970 | 726f | 6362 | 6f64 | 7928 | 5072 | 6f63 | 426f |
| 2571140 | 6479 | 292c | 0a09 | 6e6f | 6e76 | 6172 | 284e | 756d | 4353 | 7465 | 7073 | 292c | 0909 | 0925 | 204e | 756d | 6265 | 7220 | 6f66 | 2063 | 6f6e | 7472 | 6f6c | 2073 |
| 2571220 | 7465 | 7073 | 206b | 6e6f | 776e | 0a09 | 7072 | 6f63 | 626f | 6479 | 5f6f | 7065 | 7261 | 746f | 7273 | 2850 | 726f | 6342 | 6f64 | 792c | 204f | 7065 | 7261 | 746f |
| 2571300 | 7249 | 6473 | 292c | 0a09 | 6f70 | 6572 | 6174 | 6f72 | 735f | 616e | 645f | 6964 | 7328 | 4f70 | 6572 | 6174 | 6f72 | 732c | 204f | 7065 | 7261 | 746f | 7249 | 6473 |
| 2571360 | 292c | 0a09 | 7363 | 6865 | 6475 | 6c65 | 5f61 | 6c61 | 705f | 6f70 | 6572 | 6174 | 6f72 | 7328 | 4f70 | 6572 | 6174 | 6f72 | 732c | 204e | 756d | 4353 | 7465 | 7073 |
| 2571440 | 292c | 2021 | 2e0a | 7363 | 6865 | 6475 | 6c65 | 5f61 | 6c61 | 705f | 7072 | 6f63 | 626f | 6479 | 2850 | 726f | 6342 | 6f64 | 7949 | 642c | 204e | 756d | 4353 | 7465 |
| 2571520 | 7073 | 2920 | 3a2d | 0a09 | 6973 | 5f70 | 726f | 6362 | 6f64 | 7928 | 5072 | 6f63 | 426f | 6479 | 4964 | 292c | 0a09 | 7072 | 6f63 | 626f | 6479 | 5f69 | 6428 | 5072 |
| 2571600 | 6f63 | 426f | 6479 | 2c20 | 5072 | 6f63 | 426f | 6479 | 4964 | 292c | 0a09 | 6578 | 6973 | 7473 | 5f70 | 726f | 6362 | 6f64 | 7928 | 5072 | 6f63 | 426f | 6479 | 292c |
| 2571660 | 0a09 | 7363 | 6865 | 6475 | 6c65 | 5f61 | 6c61 | 705f | 7072 | 6f63 | 626f | 6479 | 2850 | 726f | 6342 | 6f64 | 792c | 204e | 756d | 4353 | 7465 | 7073 | 292e | 0a0a |
| 2571740 | 2525 | 2053 | 6368 | 6564 | 756c | 6520 | 6120 | 6c69 | 7374 | 206f | 6620 | 6f70 | 6572 | 6174 | 6f72 | 7320 | 414c | 4150 | 0a25 | 2520 | 5365 | 6c65 | 6374 | 2061 |
| 2572020 | 6e20 | 6f70 | 6572 | 6174 | 6f72 | 2066 | 726f | 6d20 | 7468 | 6520 | 6c69 | 7374 | 2061 | 6e64 | 2074 | 7279 | 2074 | 6f20 | 7363 | 6865 | 6475 | 6c65 | 2069 | 7420 |
| 2572100 | 696e | 2074 | 6865 | 2063 | 7572 | 7265 | 6e74 | 0a25 | 2520 | 436f | 6e74 | 726f | 6c20 | 7374 | 6570 | 2e20 | 4966 | 206e | 6f6e | 6520 | 6f66 | 2074 | 6865 | 206f |
| 2572160 | 7065 | 7261 | 746f | 7273 | 2069 | 6e20 | 7468 | 6520 | 6c69 | 7374 | 2063 | 616e | 2062 | 6520 | 7363 | 6865 | 6475 | 6c65 | 6420 | 696e | 0a25 | 2520 | 7468 | 6520 |
| 2572240 | 6375 | 7272 | 656e | 7420 | 636f | 6e74 | 726f | 6c20 | 7374 | 6570 | 2074 | 6865 | 6e20 | 7472 | 7920 | 7363 | 6865 | 6475 | 6c69 | 6e67 | 2074 | 6865 | 6d20 | 696e |
| 2572320 | 2074 | 6865 | 2070 | 7265 | 7669 | 6f75 | 730a | 2525 | 2063 | 6f6e | 7472 | 6f6c | 2073 | 7465 | 702e | 0a0a | 7363 | 6865 | 6475 | 6c65 | 5f61 | 6c61 | 705f | 6f70 |
| 2572400 | 6572 | 6174 | 6f72 | 7328 | 5b5d | 2c20 | 5f29 | 203a | 2d20 | 212e | 0a73 | 6368 | 6564 | 756c | 655f | 616c | 6170 | 5f6f | 7065 | 7261 | 746f | 7273 | 284c | 6973 |
| 2572460 | 742c | 2043 | 5374 | 6570 | 2920 | 3a2d | 0a09 | 280a | 0920 | 2020 | 2073 | 656c | 6563 | 7428 | 4f70 | 6572 | 6174 | 6f72 | 2c20 | 4c69 | 7374 | 2c20 | 5265 | 7374 |
| 2572540 | 292c | 0a09 | 2020 | 2020 | 7363 | 6865 | 6475 | 6c65 | 5f61 | 6c61 | 705f | 6f70 | 6572 | 6174 | 6f72 | 284f | 7065 | 7261 | 746f | 722c | 2043 | 5374 | 6570 | 292c |
| 2572620 | 0a09 | 2020 | 2020 | 7363 | 6865 | 6475 | 6c65 | 5f61 | 6c61 | 705f | 6f70 | 6572 | 6174 | 6f72 | 7328 | 5265 | 7374 | 2c20 | 4353 | 7465 | 7029 | 0a09 | 3b0a | 0920 |
| 2572700 | 2020 | 204e | 6578 | 7443 | 5374 | 6570 | 2069 | 7320 | 4353 | 7465 | 7020 | 2d20 | 312c | 0a09 | 2020 | 2020 | 7363 | 6865 | 6475 | 6c65 | 5f61 | 6c61 | 705f | 6f70 |
| 2572760 | 6572 | 6174 | 6f72 | 7328 | 4c69 | 7374 | 2c20 | 4e65 | 7874 | 4353 | 7465 | 7029 | 0a09 | 292e | 0a0a | 2525 | 2043 | 616e | 2073 | 6368 | 6564 | 756c | 6520 | 616e |
| 2573040 | 206f | 7065 | 7261 | 746f | 7220 | 6966 | 2074 | 6865 | 7265 | 2069 | 7320 | 6e6f | 2077 | 6179 | 2079 | 6f75 | 2063 | 616e | 6e6f | 7420 | 7363 | 6865 | 6475 | 6c65 |
| 2573120 | 2069 | 742e | 0a0a | 7363 | 6865 | 6475 | 6c65 | 5f61 | 6c61 | 705f | 6f70 | 6572 | 6174 | 6f72 | 284f | 7065 | 7261 | 746f | 722c | 2043 | 5374 | 6570 | 2920 | 3a2d |
| 2573200 | 0a09 | 5c2b | 2063 | 616e | 6e6f | 745f | 7363 | 6865 | 6475 | 6c65 | 5f61 | 6c61 | 705f | 6f70 | 6572 | 6174 | 6f72 | 284f | 7065 | 7261 | 746f | 722c | 2043 | 5374 |
| 2573260 | 6570 | 292c | 0a09 | 7075 | 7464 | 625f | 616c | 6170 | 5f73 | 6368 | 6564 | 756c | 6528 | 4f70 | 6572 | 6174 | 6f72 | 2c20 | 4353 | 7465 | 7029 | 2e0a | 0a25 | 2520 |
| 2573340 | 4361 | 6e6e | 6f74 | 2073 | 6368 | 6564 | 756c | 6520 | 4f70 | 6572 | 6174 | 6f72 | 2069 | 6620 | 7468 | 6572 | 6520 | 6578 | 6973 | 7473 | 2061 | 6e20 | 224f | 7022 |
| 2573420 | 0a25 | 2520 | 666f | 6c6c | 6f77 | 696e | 6720 | 224f | 7065 | 7261 | 746f | 7222 | 2077 | 6869 | 6368 | 2068 | 6173 | 206e | 6f74 | 2062 | 6565 | 6e20 | 7363 | 6865 |
| 2573500 | 6475 | 6c65 | 642e | 0a0a | 6361 | 6e6e | 6f74 | 5f73 | 6368 | 6564 | 756c | 655f | 616c | 6170 | 5f6f | 7065 | 7261 | 746f | 7228 | 4f70 | 6572 | 6174 | 6f72 | 2c20 |
| 2573560 | 4353 | 7465 | 7029 | 203a | 2d0a | 0970 | 7265 | 6365 | 6465 | 735f | 696d | 6d65 | 6469 | 6174 | 6528 | 4f70 | 6572 | 6174 | 6f72 | 2c20 | 4f70 | 292c | 0a09 | 5c2b |
| 2573640 | 2073 | 6368 | 6564 | 756c | 6564 | 5f61 | 6c61 | 7028 | 4f70 | 2c20 | 4353 | 7465 | 7029 | 2e0a | 0a25 | 2520 | 416e | 206f | 7065 | 7261 | 746f | 7220 | 6861 | 7320 |
| 2573720 | 616c | 7265 | 6164 | 7920 | 6265 | 656e | 2073 | 6365 | 6864 | 756c | 6564 | 2061 | 6c61 | 700a | 0a73 | 6368 | 6564 | 756c | 6564 | 5f61 | 6c61 | 7028 | 4f70 | 2c20 |
| 2574000 | 4353 | 7465 | 7029 | 203a | 2d0a | 096f | 7065 | 7261 | 746f | 725f | 6964 | 284f | 702c | 204f | 7049 | 6429 | 2c0a | 0965 | 7869 | 7374 | 735f | 616c | 6170 | 5f73 |
| 2574060 | 6368 | 6564 | 756c | 6528 | 4f70 | 4964 | 2c20 | 4353 | 7465 | 7042 | 6567 | 696e | 2c20 | 4353 | 7465 | 7045 | 6e64 | 292c | 2021 | 2c0a | 0943 | 5374 | 6570 | 4265 |

```
2574140  6769 6e20 3e20 4353 7465 702c 0a09 4353 7465 7045 6e64 203e 2043 5374 6570 2e0a 0a25 2520 4461 7461 6261 7365 2061 6363
2574220  6573 730a 0a70 7574 6462 5f61 6c61 705f 7363 6865 6475 6c65 284f 702c 2043 5374 6570 2920 3a2d 0a09 6f70 6572 6174 6f72
2574300  5f69 6420 4f70 2c20 4f70 4964 292c 0a09 7075 7464 6228 616c 6170 5f73 6368 6564 756c 6528 4f70 4964 2c20 4353 7465 702c
2574360  2043 5374 6570 2929 2e0a 0a65 7869 7374 735f 616c 6170 5f73 6368 6564 756c 6528 4f70 4964 2c20 4353 7465 7042 6567 696e
2574440  2c20 4353 7465 7045 6e64 2920 3a2d 0a09 6765 7464 6228 616c 6170 5f73 6368 6564 756c 6528 4f70 4964 2c20 4353 7465 7042
2574520  6567 696e 2c20 4353 7465 7045 6e64 2929 2e0a 0a25 2525 2525 2525 2525 2525 2525 2525 2525 2525 2525 2525 2525 2525 2525
2574600  2525 2525 2525 2525 2525 2525 2525 2525 2525 2525 2525 2525 2525 2525 2525 2525 2525 2525 2525 2525 2525 2525 2525 2525
2574660  250a 2525 204d 6f62 696c 6974 7920 6f66 2061 6e20 6f70 6572 6174 6f72 0a0a 256f 7065 7261 746f 725f 6964 5f6d 6f62 696c
2574740  6974 7928 4f70 4964 2c20 4d6f 6269 6c69 7479 2920 3a2d 0a09 0a6f 7065 7261 746f 725f 6d6f 6269 6c69 7479 284f 702c 204d
2575020  6f62 696c 6974 7929 203a 2d0a 0965 7869 7374 735f 6f70 6572 6174 6f72 284f 7029 2c0a 096f 7065 7261 746f 725f 6964 284f
2575100  702c 204f 7049 6429 2c0a 0965 7869 7374 735f 6173 6170 5f73 6368 6564 756c 6528 4f70 4964 2c20 4153 4150 6265 6769 6e2c
2575160  205f 292c 0a09 6578 6973 7473 5f61 6c61 705f 7363 6865 6475 6c65 284f 7049 642c 2041 4c41 5062 6567 696e 2c20 5f29 2c0a
2575240  094d 6f62 696c 6974 7920 6973 2041 4c41 5062 6567 696e 202d 2041 5341 5062 6567 696e 2e0a 090a 0a25 2525 2525 2525 2525
2575320  2525 2525 2525 2525 2525 2525 2525 2525 2525 2525 2525 2525 2525 2525 2525 2525 2525 2525 2525 2525 2525 2525 2525 2525
2575400  2525 2525 2525 2525 2525 2525 2525 2525 2525 2525 250a 3a2d 2065 6e73 7572 655f 6c6f 6164 6564 286c 6962 7261 7279 2862
2575460  6574 7765 656e 2929 2e0a 0a6f 7065 7261 746f 7273 5f69 6e5f 6173 6170 5f73 6368 6564 756c 6528 5b5d 2c20 5b5d 2920 3a2d
2575540  2021 2e0a 6f70 6572 6174 6f72 735f 696e 5f61 7361 705f 7363 6865 6475 6c65 285b 4353 7465 707c 5461 696c 5d2c 205b 4f70
2575620  6572 6174 6f72 4944 737c 5265 7374 5d29 203a 2d0a 0966 696e 6461 6c6c 284f 7049 642c 2065 7869 7374 735f 6173 6170 5f73
2575700  6368 6564 756c 6528 4f70 4964 2c20 4353 7465 702c 205f 292c 204f 7065 7261 746f 7249 4473 292c 0a09 212c 0a09 6f70 6572
2575760  6174 6f72 735f 696e 5f61 7361 705f 7363 6865 6475 6c65 2854 6169 6c2c 2052 6573 7429 2e0a 0a6f 7065 7261 746f 7273 5f69
2576040  6e5f 7363 6865 6475 6c65 2853 6368 6564 756c 652c 204e 756d 436f 6e74 726f 6c53 7465 7073 2c20 4c69 7374 4f66 4f70 6572
2576120  6174 6f72 7329 203a 2d0a 096f 7065 7261 746f 7273 5f69 6e5f 7363 6865 6475 6c65 2853 6368 6564 756c 652c 205f 2c20 4e75
2576200  6d43 6f6e 7472 6f6c 5374 6570 732c 204c 6973 744f 664f 7065 7261 746f 7273 292e 0a09 0a6f 7065 7261 746f 7273 5f69 6e5f
2576260  7363 6865 6475 6c65 2853 6368 6564 756c 652c 2044 6573 6967 6e2c 204e 756d 436f 6e74 726f 6c53 7465 7073 2c20 4c69 7374
2576340  4f66 4f70 6572 6174 6f72 7329 203a 2d0a 096e 756d 6c69 7374 2831 2c20 4e75 6d43 6f6e 7472 6f6c 5374 6570 732c 204c 6973
2576420  7443 6f6e 7472 6f6c 5374 6570 7329 2c20 0a09 6f70 6572 6174 6f72 735f 696e 5f73 6368 6564 756c 6531 284c 6973 7443 6f6e
2576500  7472 6f6c 5374 6570 732c 2053 6368 6564 756c 652c 2044 6573 6967 6e2c 204c 6973 744f 664f 7065 7261 746f 7273 292e 0a09
2576560  0a6f 7065 7261 746f 7273 5f69 6e5f 7363 6865 6475 6c65 3128 5b5d 2c20 5f2c 205f 2c20 5b5d 2920 3a2d 2021 2e0a 6f70 6572
2576640  6174 6f72 735f 696e 5f73 6368 6564 756c 6531 285b 4353 7465 707c 5461 696c 5d2c 2053 6368 6564 756c 652c 2044 6573 6967
2576720  6e2c 205b 4f70 6572 6174 6f72 4944 737c 5265 7374 5d29 203a 2d0a 0966 696e 6461 6c6c 284f 7049 642c 2063 616c 6c28 5363
2577000  6865 6475 6c65 2c20 4f70 4964 2c20 4465 7369 676e 2c20 5f2c 2043 5374 6570 2c20 5f29 2c20 4f70 6572 6174 6f72 4944 7329
2577060  2c0a 0921 2c0a 096f 7065 7261 746f 7273 5f69 6e5f 7363 6865 6475 6c65 3128 5461 696c 2c20 5363 6865 6475 6c65 2c20 4465
2577140  7369 676e 2c20 5265 7374 292e 0a0a 2525 2525 2525 2525 2525 2525 2525 2525 2525 2525 2525 2525 2525 2525 2525 2525 2525
2577220  2525 2525 2525 2525 2525 2525 2525 2525 2525 2525 2525 2525 2525 2525 2525 2525 2525 2525 2525 2525 2525 2525 0a12 e752
2577300  0000 0373 0012 e75a 0000 032b 0012 e762 0000 03bb 0012 e76a 0000 017b 0012 e772 0000 03b3 0012 e77a 0000 019b 0012 e782
2577360  0000 0173 0012 e78a 0000 018b 0012 e792 0000 017b 0012 e79a 0000 039b 0012 e7a2 0000 03a3 0012 e7aa 0000 030b 0012 e7b2
2577440  0000 031b 0012 e7ba 0000 035b 0012 e7c2 0000 0173 0012 e7ca 0000 0383 0012 e7d2 0000 0363 0000 0007 0000 017b 0012 e79a
2577520  0012 e7e6 0000 017b 0012 e7ee 0000 0343 0012 e7f6 0000 037b 0012 e7fe 0000 036b 0012 e806 0000 032b 0012 e80e 0000 017b
2577600  0012 e816 0000 037b 0012 e81e 0000 039b 0012 e826 0000 030b 0012 e82e 0000 039b 0012 e836 0000 018b 0012 e83e 0000 017b
2577660  0012 e846 0000 030b 0012 e84e 0000 017b 0012 e856 0000 03b3 0012 e85e 0000 034b 0012 e866 0000 0353 0012 e86e 0000 030b
2577740  0012 e876 0000 03cb 0012 e87e 0000 017b 0012 e886 0000 02b3 0012 e88e 0000 0243 0012 e896 0000 0223 0012 e89e 0000 0263
2600020  0012 e8a6 0000 017b 0012 e8ae 0000 0383 0012 e8b6 0000 030b 0012 e8be 0000 0393 0012 e8c6 0000 039b 0012 e8ce 0000 032b
2600100  0012 e8d6 0000 0393 0012 e8de 0000 017b 0012 e8e6 0000 0383 0012 e8ee 0000 0393 0012 e8f6 0000 037b 0012 e8fe 0000 0363
2600160  0012 e906 0000 037b 0012 e90e 0000 033b 0012 e916 0000 017b 0012 e91e 0000 0373 0012 e926 0000 032b 0012 e92e 0000 03bb
2600240  0012 e936 0000 0373 0012 e93e 0000 032b 0012 e946 0000 03bb 0012 e94e 0000 017b 0012 e956 0000 03b3 0012 e95e 0000 019b
2600320  0012 e966 0000 0173 0012 e96e 0000 018b 0000 0007 0200 09cf 0012 e978 0012 e97c 0012 e986 0000 037b 0012 e98e 0000 036b
2600400  0012 e996 0000 032b 0012 e99e 0000 017b 0012 e9a6 0000 037b 0012 e9ae 0000 039b 0012 e9b6 0000 030b 0012 e9be 0000 039b
2600460  0012 e9c6 0000 018b 0012 e9ce 0000 017b 0012 e9d6 0000 030b 0012 e9de 0000 017b 0012 e9e6 0000 03b3 0012 e9ee 0000 034b
2600540  0012 e9f6 0000 0353 0012 e9fe 0000 030b 0012 ea06 0000 03cb 0012 ea0e 0000 017b 0012 ea16 0000 02b3 0012 ea1e 0000 0243
2600620  0012 ea26 0000 0223 0012 ea2e 0000 0263 0012 ea36 0000 017b 0012 ea3e 0000 0383 0012 ea46 0000 030b 0012 ea4e 0000 0393
2600700  0012 ea56 0000 039b 0012 ea5e 0000 032b 0012 ea66 0000 0393 0012 ea6e 0000 017b 0012 ea76 0000 0383 0012 ea7e 0000 0393
2600760  0012 ea86 0000 037b 0012 ea8e 0000 0363 0012 ea96 0000 037b 0012 ea9e 0000 033b 0012 eaa6 0000 017b 0012 eaae 0000 0373
2601040  0012 eab6 0000 032b 0012 eabe 0000 03bb 0012 eac6 0000 0373 0012 eace 0000 032b 0012 ead6 0000 03bb 0012 eade 0000 017b
2601120  0012 eae6 0000 03b3 0012 eaee 0000 019b 0012 eaf6 0000 0173 0012 eafe 0000 018b 0012 eb06 0000 017b 0012 eb0e 0000 039b
2601200  0012 eb16 0000 03a3 0012 eb1e 0000 030b 0012 eb26 0000 031b 0012 eb2e 0000 035b 0012 eb36 0000 0173 0012 eb3e 0000 0383
```

```
2601260 0012 eb46 0000 0363 0000 0007 0000 0173 0012 eb56 0000 0383 0012 eb5e 0000 0363 0000 0007 0000 0363 0012 ed36 0000 017b
2601340 0000 0007 0000 0343 0012 eb6e 0000 037b 0012 eb76 0000 036b 0012 eb7e 0000 032b 0012 eb86 0000 017b 0012 eb8e 0000 037b
2601420 0012 eb96 0000 039b 0012 eb9e 0000 030b 0012 eba6 0000 039b 0012 ebae 0000 018b 0011 2fb0 0300 695f 0000 3287 0000 000c
2601500 000a 18f0 0002 438a 0003 006c 0000 0000 0011 3000 0300 6967 0000 3287 0000 000c 000a 18f0 0002 438a 0003 006c 0000 0000
2601560 0012 6173 6170 5f63 6f6e 7472 6f6c 5f73 7465 7073 0000 0243 0011 3034 0200 696f 0000 3287 0000 0008 000a 18f0 0002 438a
2601640 0003 006c 0000 0000 0011 2e74 0500 6947 0000 3287 0000 0014 000a 18f0 000a 2c14 0003 008d 0000 0000 0011 3094 0300 6977
2601720 0000 3287 0000 000c 000a 18f0 000b 70c4 0003 008d 0000 0000 0011 3208 0200 69a7 0000 3287 0000 0008 0012 c7e4 0012 c7e4
2602000 0001 006c 0000 0000 0012 ebc0 0500 695f 0000 3287 0000 0014 0012 7a48 0012 7a48 0001 006c 0000 0000 0012 ebe0 0500 6967
2602060 0000 3287 0000 0014 0012 ecd8 0012 ecd8 0001 006c 0000 0000 2c78 0014 0002 438a 3600 3678 0018 22bc 0012 ebf0 0012 ec18
2602140 0300 696f 0000 3287 0000 000c 0012 ca84 0012 ca84 0001 006c 0000 0000 0016 7363 6865 6475 6c65 5f61 7361 705f 7072 6f63
2602220 626f 6479 0000 035b 0017 7363 6865 6475 6c65 5f61 7361 705f 6f70 6572 6174 6f72 7300 ed36 0018 7075 7464 625f 6173 6170
2602300 5f63 6f6e 7472 6f6c 5f73 7465 7073 0099 0011 30d8 0200 697f 0000 3287 0000 0008 0012 9ee0 0012 9f4c 0001 006c 0000 0000
2602360 0011 3178 0300 6987 0000 3287 0000 000c 0012 eef8 0012 a138 0001 006c 0000 0000 0011 31a8 0200 698f 0000 3287 0000 0008
2602440 0012 edc0 0012 edc0 0001 006c 0000 0000 2c78 001c 0002 438a 362c 43c0 0200 696f 6bc8 6b88 239c 0000 0012 0c40 0018 6765
2602520 7464 625f 6173 6170 5f63 6f6e 7472 6f6c 5f73 7465 7073 00fd 0011 31c8 0200 6997 0000 3287 0000 0008 0012 ee18 0012 ee18
2602600 0001 006c 0000 0000 2c78 001c 0002 438a 362c 43c0 0200 696f 6bc8 6b88 239c 0000 0012 08d8 001b 7265 6d6f 7665 6462 5f61
2602660 7361 705f 636f 6e74 726f 6c5f 7374 6570 7300 000b 0011 31e8 0200 699f 0000 3287 0000 0008 0012 ee74 0012 ee74 0001 006c
2602740 0000 0000 2c78 001c 0002 438a 362c 43c0 0200 696f 6bc8 6b88 239c 0000 0012 738c 0019 6578 6973 7473 5f61 7361 705f 636f
2603020 6e74 726f 6c5f 7374 6570 7300 0012 ed80 0200 6987 0000 3287 0000 0008 0012 eecc 0012 eecc 0001 006c 0000 0000 2c78 0018
2603100 0002 438a 3640 41e8 0000 000b 239c 0000 0012 ed90 2938 0014 0012 a138 4e1c 0000 0000 0007 4960 2edc 27f0 002b 0012 a138
2603160 2ca0 ebd1 0000 0000 0000 0001 0012 eee4 0012 a138 0002 438a 0010 d4c4 0016 7363 6865 6475 6c65 5f61 7361 705f 6f70 6572
2603240 6174 6f72 0000 32df 0011 3248 0200 69af 0000 3287 0000 0008 0012 a1c4 0012 a1c4 0001 006c 0000 0000 001d 6361 6e6e 6f74
2603320 5f73 6368 6564 756c 655f 6173 6170 5f6f 7065 7261 746f 7200 0013 7075 7464 625f 6173 6170 5f73 6368 6564 756c 6500 3077
2603400 0011 3288 0200 69b7 0000 3287 0000 0008 0012 a22c 0012 a22c 0001 006c 0000 0000 0011 32f8 0200 69bf 0000 3287 0000 0008
2603460 0012 a308 0012 a308 0001 006c 0000 0000 000e 7363 6865 6475 6c65 645f 6173 6170 0012 ebe9 0011 333c 0200 69c7 0000 3287
2603540 0000 0008 0012 a29c 0012 a29c 0001 006c 0000 0000 0014 6578 6973 7473 5f61 7361 705f 7363 6865 6475 6c65 0015 0011 38cc
2603620 0300 69cf 0000 3287 0000 000c 0012 f060 0012 f060 0001 006c 0000 0000 001e 4f70 6572 6174 6f72 207e 642c 2043 6f6e 7472
2603700 6f6c 2053 7465 7020 7e64 7e6e 0012 f06a 2c78 001c 0002 438a 3690 43c0 0300 695f 6c08 6b88 6bc8 22bc 0012 08d8 0016 7363
2603760 6865 6475 6c65 5f61 6c61 705f 7072 6f63 626f 6479 0012 f071 0017 7363 6865 6475 6c65 5f61 6c61 705f 6f70 6572 6174 6f72
2604040 7300 f09d 0011 3420 0200 69df 0000 3287 0000 0008 0012 a050 0012 a444 0001 006c 0000 0000 0011 3480 0200 69e7 0000 3287
2604120 0000 0008 0012 f138 0012 a4b0 0001 006c 0000 0000 2938 0012 0012 a4b0 4e1c 0000 0000 0007 2edc 000b 27f0 eed0 0012 a4b0
2604200 2ca0 e739 0000 0000 0000 0001 0012 f0f4 0012 a4b0 0002 438a 000e 8670 0016 7363 6865 6475 6c65 5f61 6c61 705f 6f70 6572
2604260 6174 6f72 0000 2a87 0011 3518 0200 69ef 0000 3287 0000 0008 0012 a530 0012 a530 0001 006c 0000 0000 001d 6361 6e6e 6f74
2604340 5f73 6368 6564 756c 655f 616c 6170 5f6f 7065 7261 746f 7200 0013 7075 7464 625f 616c 6170 5f73 6368 6564 756c 6500 0df7
2604420 0011 3570 0200 69f7 0000 3287 0000 0008 0012 a598 0012 a598 0001 006c 0000 0000 0011 35f8 0200 69ff 0000 3287 0000 0008
2604500 0012 f24c 0012 f24c 0001 006c 0000 0000 000e 7363 6865 6475 6c65 645f 616c 6170 0012 ec71 0011 3628 0200 6a07 0000 3287
2604560 0000 0008 0012 a604 0012 a604 0001 006c 0000 0000 0014 6578 6973 7473 5f61 6c61 705f 7363 6865 6475 6c65 004d 0011 3648
2604640 0300 6a0f 0000 3287 0000 000c 0012 f274 0012 f274 0001 006c 0000 0000 2c78 0028 0002 438a 2520 46d8 332c 247c 0012 0508
2604720 0014 43c0 0300 6967 6d50 6d0c 6d0c 234c 0012 0c40 2c78 001c 0002 438a 3690 43c0 0300 6967 6c08 6b88 6bc8 22bc 0012 08d8
2605000 0011 6f70 6572 6174 6f72 5f6d 6f62 696c 6974 7900 0011 36ec 0200 6a17 0000 3287 0000 0008 0012 a6e0 0012 a6e0 0001 006c
2605060 0000 0000 0012 f3a0 0000 0090 b288 b66c 0000 0cd6 7fff ffff 0013 3754 0200 0db5 0100 15ad 0100 33fd 0000 000b 0000 315f
2605140 0012 f320 0000 002c b288 b66c 0000 0cd6 7fff ffff 0012 f2cc 0200 0db5 0100 15ad 0100 33fd 0000 000b 0000 315f 0012 f3a0
2605220 0000 0038 b27c b66c 0000 0cd7 0000 0cfa 0012 f3a4 0200 0db5 0500 1cdd 0000 6a8f 0000 0013 0000 3287 0099 bbe3 0000 0363
2605300 0000 315f 2954 0048 0002 438a 56f8 67ec 0018 692c 5758 6784 6a00 442c 0300 69cf 671c 6c84 0018 5fa0 44a0 0000 0200 0daf
2605360 4b8c 0000 0000 3287 6c34 247c 0008 c03c 0014 2ecc 2410 0000 0013 377c 0012 f43c 0000 0070 b27c b66c 0000 0cd8 0000 0cfb
2605440 0012 f3dc 0200 0db5 0500 1cdd 0000 6a97 0000 001b 0000 3287 0099 bec3 0000 0363 0000 315f 0012 f43c 0000 0038 b27c b66c
2605520 0000 0cd9 0000 0cfc 0012 f440 0200 0db5 0500 1cdd 0000 6a97 0000 0023 0000 3287 0099 c063 0000 0363 0000 315f 2c78 002c
2605600 0002 438a 45c4 4700 35ec 47e4 33a0 42ac 0000 000b 0013 371c 001c 38e8 386c 37f0 3cf4 234c 0013 382c 0012 f4c4 0000 0038
2605660 b130 b66c 0000 0cda 0000 0cfd 0012 9cfd 0200 0db5 0500 1cdd 0000 6a9f 0000 0023 0000 3287 0099 c163 0000 0363 0000 315f
2605740 2954 0050 0002 438a 56f8 67ec 0018 682c 46ec 4768 5818 6784 6aa0 442c 0600 1ea7 6d50 671c 6d94 5fa0 6c84 0018 5fa0 43e4
2606020 0200 0daf 4b8c 0000 0000 3287 6c34 247c 0008 c03c 001c 2ecc 23e4 0000 0013 382c 0013 1370 0000 1e0c 008a 353d 0011 3d7c
2606100 0000 0000 0000 0000 0000 0000 0000 0000 0000 0000 0000 0000 0000 0000 0000 0000 0000 0000 0000 0000 0012 c4ec 0012 c468
2606160 0013 1370 0000 1dcc 656e 5f6e 6174 282b 2c20 2d29 2c0a 096e 756d 6c69 7374 283f 2c20 3f2c 203f 292c 0a09 2020 2020 616e
2606240 6368 6f72 282b 2c20 2b2c 202d 2c20 2d29 2c0a 0909 616e 6368 6f72 282b 2c20 2b2c 202d 292c 0a09 2020 2020 6e75 6d6c 6973
2606320 7431 282b 2c20 2b2c 203f 292c 0a09 096e 756d 6c69 7374 3228 2b2c 202b 2c20 3f29 2c0a 0972 6570 6561 7428 2b29 2e0a 0a73
```

| | | | | | | | | | | | | | | | | | | | | | | | | |
|---|---|---|---|---|---|---|---|---|---|---|---|---|---|---|---|---|---|---|---|---|---|---|---|---|
| 2606400 | 6363 | 735f | 6964 | 2927 | 2240 | 2823 | 2938 | 382f | 3131 | 2f30 | 3220 | 6265 | 7477 | 6565 | 6e2e | 706c | 0932 | 372e | 3122 | 2729 | 2e0a | 0a0a | 2520 | 2020 |
| 2606460 | 6265 | 7477 | 6565 | 6e28 | 2b4c | 6f77 | 6572 | 2c20 | 2b55 | 7070 | 6572 | 2c20 | 3f4e | 756d | 6265 | 7229 | 0a25 | 2020 | 2069 | 7320 | 7472 | 7565 | 2077 | 6865 |
| 2606540 | 6e20 | 4c6f | 7765 | 722c | 2055 | 7070 | 6572 | 2c20 | 616e | 6420 | 4e75 | 6d62 | 6572 | 2061 | 7265 | 2069 | 6e74 | 6567 | 6572 | 732c | 0a25 | 2020 | 2061 | 6e64 |
| 2606620 | 204c | 6f77 | 6572 | 203d | 3c20 | 4e75 | 6d62 | 6572 | 2031 | 3c20 | 5570 | 7065 | 722e | 2020 | 4966 | 204c | 6f77 | 6572 | 2061 | 6e64 | 2055 | 7070 | 6572 | 2061 |
| 2606700 | 7265 | 2067 | 6976 | 656e | 2c0a | 2520 | 2020 | 4e75 | 6d62 | 6572 | 2063 | 616e | 2062 | 6520 | 7465 | 7374 | 6564 | 206f | 7220 | 656e | 756d | 6572 | 6174 | 6564 |
| 2606760 | 2e20 | 2049 | 6620 | 6569 | 7468 | 6572 | 204c | 6f77 | 6572 | 206f | 7220 | 5570 | 7065 | 720a | 2520 | 2020 | 6973 | 2061 | 6273 | 656e | 742c | 2074 | 6865 | 7265 |
| 2607040 | 2069 | 7320 | 6e6f | 7420 | 656e | 6f75 | 6768 | 2069 | 6e66 | 6f72 | 6d61 | 7469 | 6f6e | 2074 | 6f20 | 6669 | 6e64 | 2069 | 742c | 2061 | 6e64 | 2061 | 6e0a | 2520 |
| 2607120 | 2020 | 6572 | 726f | 7220 | 7769 | 6c6c | 2062 | 6520 | 7265 | 706f | 7274 | 6564 | 2e0a | 0a62 | 6574 | 7765 | 656e | 284c | 6f77 | 6572 | 2c20 | 5570 | 7065 | 722c |
| 2607200 | 2050 | 6f69 | 6e74 | 2920 | 3a2d | 0a09 | 696e | 7465 | 6765 | 7228 | 4c6f | 7765 | 7229 | 2c0a | 0969 | 6e74 | 6567 | 6572 | 2855 | 7070 | 6572 | 292c | 0a09 | 2820 |
| 2607260 | 2020 | 696e | 7465 | 6765 | 7228 | 506f | 696e | 7429 | 2c20 | 212c | 0909 | 2520 | 2054 | 6865 | 7365 | 2063 | 7574 | 7320 | 6d75 | 7374 | 2062 | 6520 | 6375 | 7473 |
| 2607340 | 3b0a | 0920 | 2020 | 204c | 6f77 | 6572 | 203d | 3c20 | 506f | 696e | 742c | 2050 | 6f69 | 6e74 | 203d | 3c20 | 5570 | 7065 | 720a | 093b | 2020 | 2076 | 6172 | 2850 |
| 2607420 | 6f69 | 6e74 | 292c | 2021 | 2c09 | 0925 | 2020 | 7468 | 6579 | 2063 | 616e | 2774 | 2062 | 6520 | 6172 | 726f | 7773 | 2e0a | 0920 | 2020 | 204c | 6f77 | 6572 | 203d |
| 2607500 | 3c20 | 5570 | 7065 | 722c | 0a09 | 2020 | 2020 | 6265 | 7477 | 6565 | 6e31 | 284c | 6f77 | 6572 | 2c20 | 5570 | 7065 | 722c | 2050 | 6f69 | 6e74 | 290a | 0929 | 2e0a |
| 2607560 | 6265 | 7477 | 6565 | 6e28 | 4c6f | 7765 | 722c | 2055 | 7070 | 6572 | 2c20 | 506f | 696e | 7429 | 203a | 2d0a | 0947 | 6f61 | 6c20 | 3d20 | 6265 | 7477 | 6565 | 6e28 |
| 2607640 | 4c6f | 7765 | 722c | 5570 | 7065 | 722c | 506f | 696e | 7429 | 2c0a | 096d | 7573 | 745f | 6265 | 5f69 | 6e74 | 6567 | 6572 | 284c | 6f77 | 6572 | 2c20 | 312c | 2047 |
| 2607720 | 6f61 | 6c29 | 2c0a | 096d | 7573 | 745f | 6265 | 5f69 | 6e74 | 6567 | 6572 | 2855 | 7070 | 6572 | 2c20 | 322c | 2047 | 6f61 | 6c29 | 2c0a | 096d | 7573 | 745f | 6265 |
| 2610000 | 5f69 | 6e74 | 6567 | 6572 | 2850 | 6f69 | 6e74 | 2c20 | 332c | 2047 | 6f61 | 6c29 | 2e0a | 0a0a | 0a25 | 2520 | 2062 | 6574 | 7765 | 656e | 3128 | 4c6f | 7765 | 722c |
| 2610060 | 2055 | 7070 | 6572 | 2c20 | 506f | 696e | 7429 | 0a25 | 2020 | 2065 | 6e75 | 6d65 | 7261 | 7465 | 7320 | 7661 | 6c75 | 6573 | 206f | 6620 | 506f | 696e | 7420 | 7361 |
| 2610140 | 7469 | 7366 | 7969 | 6e67 | 204c | 6f77 | 6572 | 203d | 3c20 | 506f | 696e | 7420 | 3d3c | 2055 | 7070 | 6572 | 2c0a | 2520 | 2020 | 7768 | 6572 | 6520 | 6974 | 2069 |
| 2610220 | 7320 | 616c | 7265 | 6164 | 7920 | 6b6e | 6f77 | 6e20 | 7468 | 6174 | 204c | 6f77 | 6572 | 203d | 3c20 | 5570 | 7065 | 7220 | 616e | 6420 | 506f | 696e | 7420 | 7761 |
| 2610300 | 7320 | 610a | 2520 | 2020 | 7661 | 7269 | 6162 | 6c65 | 2e20 | 2041 | 2070 | 7572 | 6572 | 2076 | 6572 | 7369 | 6f6e | 206f | 6620 | 7468 | 6973 | 2069 | 7320 | 6c65 |
| 2610360 | 6674 | 2061 | 7320 | 6120 | 636f | 6d6d | 656e | 742e | 0a0a | 6265 | 7477 | 6565 | 6e31 | 284c | 2c20 | 4c2c | 204c | 2920 | 3a2d | 2021 | 2e0a | 6265 | 7477 | 6565 |
| 2610440 | 6e31 | 284c | 2c20 | 5f2c | 204c | 292e | 0909 | 2520 | 6265 | 7477 | 6565 | 6e31 | 284c | 2c20 | 552c | 204c | 2920 | 3a2d | 204c | 203d | 3c20 | 552e | 0a62 | 6574 |
| 2610520 | 7765 | 656e | 3128 | 4c2c | 2055 | 2c20 | 4e29 | 203a | 2d09 | 0925 | 2062 | 6574 | 7765 | 656e | 3128 | 4c2c | 2055 | 2c20 | 4e29 | 203a | 2d20 | 4c20 | 3c20 | 552c |
| 2610600 | 0a09 | 4d20 | 6973 | 204c | 2b31 | 2c09 | 0925 | 094d | 2069 | 7320 | 4c2b | 312c | 0a09 | 6265 | 7477 | 6565 | 6e31 | 284d | 2c20 | 552c | 204e | 292e | 0925 | 0962 |
| 2610660 | 6574 | 7765 | 656e | 3128 | 4d2c | 2055 | 2c20 | 4e29 | 2e0a | 0a0a | 0a25 | 2020 | 2067 | 656e | 5f6e | 6174 | 283f | 4e29 | 0a25 | 2020 | 2069 | 7320 | 7472 | 7565 |
| 2610740 | 2077 | 6865 | 6e20 | 4e20 | 6973 | 2061 | 206e | 6174 | 7572 | 616c | 206e | 756d | 6265 | 722e | 2020 | 4966 | 204e | 2069 | 7320 | 6120 | 7661 | 7269 | 6162 | 6c65 |
| 2611020 | 2c20 | 6974 | 2077 | 696c | 6c0a | 2520 | 2020 | 656e | 756d | 6572 | 6174 | 6520 | 7468 | 6520 | 6e61 | 7475 | 7261 | 6c20 | 6e75 | 6d62 | 6572 | 7320 | 302c | 312c |
| 2611100 | 322c | 2e2e | 2e20 | 616e | 6420 | 6f66 | 2063 | 6f75 | 7273 | 6520 | 6e6f | 7420 | 7465 | 7261 | 696e | 6174 | 652e | 0a25 | 2020 | 2049 | 7420 | 6973 | 206e | 6f74 |
| 2611160 | 206d | 6561 | 6e74 | 2074 | 6f20 | 6265 | 2061 | 7070 | 6c69 | 6564 | 2074 | 6f20 | 616e | 7974 | 6869 | 6e67 | 2062 | 7574 | 2069 | 6e74 | 6567 | 6572 | 7320 | 616e |
| 2611240 | 6420 | 7661 | 7269 | 6162 | 6c65 | 732e | 0a0a | 6765 | 6e5f | 6e61 | 7428 | 4e29 | 203a | 2d09 | 0909 | 2520 | 6765 | 6e2d | 6572 | 6174 | 6520 | 6e61 | 742d | 7572 |
| 2611320 | 616c | 0a09 | 2820 | 2020 | 696e | 7465 | 6765 | 7228 | 4e29 | 202d | 3e09 | 2520 | 6966 | 2077 | 6520 | 6172 | 656e | 2774 | 2074 | 6f20 | 6765 | 6e65 | 7261 | 7465 |
| 2611400 | 2069 | 740a | 0920 | 2020 | 204e | 203e | 3d20 | 3009 | 0925 | 2074 | 6573 | 7420 | 7468 | 6174 | 2069 | 7420 | 6973 | 206e | 6f74 | 206e | 6567 | 6174 | 6976 | 650a |
| 2611460 | 093b | 2020 | 2076 | 6172 | 284e | 2920 | 2d3e | 0909 | 2520 | 6966 | 2077 | 6520 | 6172 | 6520 | 746f | 2067 | 656e | 6572 | 6174 | 6520 | 6974 | 2c0a | 0920 | 2020 |
| 2611540 | 2067 | 656e | 5f6e | 6174 | 2830 | 2c20 | 4e29 | 0925 | 2064 | 6f20 | 736f | 2063 | 6f75 | 6e74 | 696e | 6720 | 7570 | 2066 | 726f | 6d20 | 302e | 0a09 | 3b20 | 2020 |
| 2611620 | 6d75 | 7374 | 5f62 | 655f | 696e | 7465 | 6765 | 7228 | 4e2c | 2031 | 2c20 | 6765 | 6e5f | 6e61 | 7428 | 4e29 | 290a | 0929 | 2e0a | 200a | 200a | 6765 | 6e5f | 6e61 |
| 2611700 | 7428 | 4c2c | 204c | 292e | 0a67 | 656e | 5f6e | 6174 | 284c | 2c20 | 4e29 | 203a | 2d09 | 0925 | 2067 | 656e | 6572 | 6174 | 6520 | 6e61 | 7475 | 7261 | 6c20 | 3e20 |
| 2611760 | 4c0a | 094d | 2069 | 7320 | 4c2b | 312c | 0a09 | 6765 | 6e5f | 6e61 | 7428 | 4d2c | 204e | 292e | 0909 | 2520 | 6765 | 6e65 | 7261 | 7465 | 206e | 6174 | 7572 | 616c |
| 2612040 | 203e | 3d20 | 4d0a | 200a | 200a | 0a25 | 2020 | 2067 | 656e | 5f69 | 6e74 | 283f | 4929 | 0a25 | 2020 | 2069 | 7320 | 7472 | 7565 | 2077 | 6865 | 6e20 | 4920 | 6973 |
| 2612120 | 2061 | 6e20 | 696e | 7465 | 6765 | 722e | 2020 | 4966 | 2049 | 2069 | 7320 | 6120 | 7661 | 7269 | 6162 | 6c65 | 2c20 | 6974 | 2077 | 696c | 6c0a | 2520 | 2020 | 656e |
| 2612200 | 756d | 6572 | 6174 | 6520 | 7468 | 6520 | 696e | 7465 | 6765 | 7273 | 2069 | 6e20 | 7468 | 6520 | 6f72 | 6465 | 7220 | 302c | 2031 | 2c20 | 2d31 | 2c20 | 322c | 202d |
| 2612260 | 322c | 2033 | 2c20 | 2d33 | 2c20 | 2663 | 2e0a | 2520 | 2020 | 4f66 | 2063 | 6f75 | 7273 | 6520 | 7468 | 6973 | 2073 | 6571 | 7565 | 6e63 | 6520 | 6861 | 7320 | 6e6f |
| 2612340 | 2065 | 6e64 | 2e0a | 2520 | 2020 | 4974 | 2069 | 7320 | 6e6f | 7420 | 6d65 | 616e | 7420 | 746f | 2062 | 6520 | 6170 | 706c | 6965 | 6420 | 746f | 2061 | 6e79 | 7468 |
| 2612420 | 696e | 6720 | 6275 | 7420 | 696e | 7465 | 6765 | 7273 | 2061 | 6e64 | 2076 | 6172 | 6961 | 626c | 6573 | 2e0a | 0a67 | 656e | 5f69 | 6e74 | 2849 | 2920 | 3a2d | 0909 |
| 2612500 | 0925 | 2067 | 656e | 2d65 | 7261 | 7465 | 2069 | 6e74 | 2d65 | 6765 | 720a | 0928 | 2020 | 2069 | 6e74 | 6567 | 6572 | 2849 | 2920 | 2d3e | 0925 | 2069 | 6620 | 7765 |
| 2612560 | 2061 | 7265 | 6e27 | 7420 | 746f | 2067 | 656e | 6572 | 6174 | 6520 | 6974 | 0a09 | 2020 | 2020 | 7472 | 7565 | 0909 | 2520 | 6a75 | 7374 | 2073 | 7563 | 6365 | 6564 |
| 2612640 | 2e0a | 093b | 2020 | 2076 | 6172 | 2849 | 2920 | 2d3e | 0909 | 2520 | 6966 | 2077 | 6520 | 6172 | 6520 | 746f | 2067 | 656e | 6572 | 6174 | 6520 | 6974 | 2c0a | 0920 |
| 2612720 | 2020 | 2067 | 656e | 5f69 | 6e74 | 2830 | 2c20 | 4929 | 0925 | 2064 | 6f20 | 736f | 2073 | 7461 | 7274 | 696e | 6720 | 6672 | 6f6d | 2030 | 2e0a | 093b | 2020 | 206d |
| 2613000 | 7573 | 745f | 6265 | 5f69 | 6e74 | 6567 | 6572 | 2849 | 2c20 | 312c | 2067 | 656e | 5f69 | 6e74 | 2849 | 2929 | 0a09 | 292e | 0a0a | 6765 | 6e5f | 696e | 7428 | 4c2c |
| 2613060 | 204c | 292e | 0a67 | 656e | 5f69 | 6e74 | 284c | 2c20 | 4e29 | 203a | 2d0a | 0928 | 2020 | 204c | 203e | 2030 | 202d | 3e20 | 4d20 | 6973 | 202d | 4c09 | 2520 | 312d |
| 2613140 | 3e20 | 2d31 | 2c20 | 322d | 3e20 | 2d32 | 2c20 | 2663 | 0a09 | 3b20 | 2020 | 4d20 | 6973 | 2031 | 2d4c | 0909 | 2520 | 302d | 3e20 | 312c | 202d | 312d | 3e20 | 322c |
| 2613220 | 2026 | 630a | 0929 | 2c0a | 0967 | 656e | 5f69 | 6e74 | 284d | 2c20 | 4e29 | 2e0a | 0a0a | 2520 | 2020 | 7265 | 7065 | 6174 | 282b | 4e29 | 0a25 | 2020 | 207b | 7768 |
| 2613300 | 6572 | 6520 | 4e20 | 6973 | 2061 | 206e | 6f6e | 2d6e | 6567 | 6174 | 6976 | 6520 | 696e | 7465 | 6765 | 727d | 2073 | 7563 | 6365 | 6564 | 7320 | 6578 | 6163 | 746c |
| 2613360 | 7920 | 4e20 | 7469 | 6d65 | 732e | 0a25 | 2020 | 2059 | 6f75 | 2063 | 616e | 206f | 6e6c | 7920 | 756e | 6465 | 7273 | 7461 | 6e64 | 2069 | 7420 | 7072 | 6f63 | 6564 |
| 2613440 | 7572 | 616c | 6c79 | 2c20 | 616e | 6420 | 7265 | 616c | 6c79 | 2069 | 7420 | 6973 | 206f | 6e6c | 790a | 2520 | 2020 | 696e | 636c | 7564 | 6564 | 2066 | 6f72 | 2063 |

| | | | | | | | | | | | | | | | | | | | | | | | | |
|---|---|---|---|---|---|---|---|---|---|---|---|---|---|---|---|---|---|---|---|---|---|---|---|---|
| 2613520 | 6f6d | 7061 | 7469 | 6269 | 6c69 | 7479 | 2077 | 6974 | 6820 | 736f | 6d65 | 206f | 7468 | 6572 | 2050 | 726f | 6c6f | 6773 | 2e0a | 0a72 | 6570 | 6561 | 7428 | 4e29 |
| 2613600 | 203a | 2d0a | 0928 | 2020 | 2069 | 6e74 | 6567 | 6572 | 284e | 2920 | 2d3e | 0a09 | 2020 | 2020 | 4e20 | 3e3d | 2031 | 2c0a | 0920 | 2020 | 2072 | 6570 | 6561 | 7431 |
| 2613660 | 284e | 290a | 093b | 2020 | 206d | 7573 | 745f | 6265 | 5f69 | 6e74 | 6567 | 6572 | 284e | 2c20 | 312c | 2072 | 6570 | 6561 | 7428 | 4e29 | 290a | 0929 | 2e0a | 0a72 |
| 2613740 | 6570 | 6561 | 7431 | 2831 | 2920 | 3a2d | 2021 | 2e09 | 0925 | 2074 | 6865 | 2073 | 7472 | 7563 | 7475 | 7265 | 206f | 6620 | 7468 | 6973 | 0a72 | 6570 | 6561 | 7431 |
| 2614020 | 285f | 292e | 0909 | 0925 | 2070 | 7265 | 6469 | 6361 | 7465 | 2069 | 7320 | 7061 | 7261 | 6c6c | 656c | 2074 | 6f0a | 7265 | 7065 | 6174 | 3128 | 4e29 | 203a | 2d09 |
| 2614100 | 0909 | 2520 | 7468 | 6520 | 7374 | 7275 | 6374 | 7572 | 6520 | 6f66 | 0a09 | 4d20 | 6973 | 204e | 2d31 | 2c09 | 0925 | 2062 | 6574 | 7765 | 656e | 312f | 3320 | 6162 |
| 2614160 | 6f76 | 652e | 0a09 | 7265 | 7065 | 6174 | 3128 | 4d29 | 2e0a | 0a0a | 2520 | 2020 | 6e75 | 6d6c | 6973 | 7428 | 3f4c | 6f77 | 6572 | 2c20 | 3f55 | 7070 | 6572 | 2c20 |
| 2614240 | 3f4c | 6973 | 7429 | 0a25 | 2020 | 2069 | 7320 | 7472 | 7565 | 2077 | 6865 | 6e20 | 4c69 | 7374 | 2069 | 7320 | 5b4c | 6f77 | 6572 | 2c20 | 2e2e | 2e2c | 2055 | 7070 |
| 2614320 | 6572 | 5d2c | 204c | 6f77 | 6572 | 2061 | 6e64 | 2055 | 7070 | 6572 | 2069 | 6e74 | 6567 | 6572 | 732e | 0a25 | 2020 | 2046 | 6f72 | 2065 | 7861 | 6d70 | 6c65 | 2c20 |
| 2614400 | 6e75 | 6d6c | 6973 | 7428 | 312c | 2033 | 2c20 | 4c29 | 2062 | 696e | 6473 | 204c | 203d | 205b | 312c | 322c | 335d | 2e0a | 2520 | 2020 | 5468 | 6973 | 2069 | 7320 |
| 2614460 | 6e6f | 7420 | 7965 | 7420 | 6173 | 2067 | 656e | 6572 | 616c | 2061 | 7320 | 6974 | 206f | 7567 | 6874 | 2074 | 6f20 | 6265 | 3a20 | 6966 | 204c | 6f77 | 6572 | 2061 |
| 2614540 | 6e64 | 2055 | 7070 | 6572 | 2061 | 7265 | 0a25 | 2020 | 206e | 6f74 | 2062 | 6f74 | 6820 | 696e | 7465 | 6765 | 7273 | 2c20 | 4c69 | 7374 | 206d | 7573 | 7420 | 6265 |
| 2614620 | 2070 | 726f | 7065 | 722c | 2061 | 6e64 | 2069 | 6620 | 4c6f | 7765 | 7220 | 616e | 6420 | 5570 | 7065 | 7220 | 6172 | 650a | 2520 | 2020 | 626f | 7468 | 2076 | 6172 |
| 2614700 | 6961 | 626c | 6573 | 2c20 | 6174 | 206c | 6561 | 7374 | 206f | 6e65 | 2065 | 6c65 | 6d65 | 6e74 | 206f | 6620 | 4c69 | 7374 | 206d | 7573 | 7420 | 6265 | 2061 | 6e20 |
| 2614760 | 696e | 7465 | 6765 | 722e | 0a25 | 2020 | 2049 | 6620 | 4c6f | 7765 | 7220 | 3d20 | 5570 | 7065 | 722b | 312c | 206e | 756d | 6c69 | 7374 | 284c | 6f77 | 6572 | 2c20 |
| 2615040 | 5570 | 7065 | 722c | 205b | 5d29 | 2069 | 7320 | 7472 | 7565 | 2e0a | 0a6e | 756d | 6c69 | 7374 | 284c | 6f77 | 6572 | 2c20 | 5570 | 7065 | 722c | 204c | 6973 | 7429 |
| 2615120 | 203a | 2d0a | 0969 | 6e74 | 6567 | 6572 | 2855 | 7070 | 6572 | 292c | 0a09 | 696e | 7465 | 6765 | 7228 | 4c6f | 7765 | 7229 | 2c0a | 0921 | 2c0a | 096e | 756d | 6c69 |
| 2615200 | 7374 | 3128 | 4c6f | 7765 | 722c | 2055 | 7070 | 6572 | 2c20 | 4c69 | 7374 | 292e | 0a6e | 756d | 6c69 | 7374 | 284c | 6f77 | 6572 | 2c20 | 5570 | 7065 | 722c | 204c |
| 2615260 | 6973 | 7429 | 203a | 2d0a | 0976 | 6172 | 2855 | 7070 | 6572 | 292c | 0909 | 0925 | 2077 | 6865 | 6e20 | 4c6f | 7765 | 7220 | 616e | 6420 | 5570 | 7065 | 7220 | 6172 |
| 2615340 | 6520 | 7661 | 7269 | 6162 | 6c65 | 732c | 0a09 | 7661 | 7228 | 4c6f | 7765 | 7229 | 2c09 | 0909 | 2520 | 616c | 6c20 | 696e | 666f | 726d | 6174 | 696f | 6e20 | 6d75 |
| 2615420 | 7374 | 2063 | 6f6d | 6520 | 6672 | 6f6d | 204c | 6973 | 742e | 0a09 | 616e | 6368 | 6f72 | 284c | 6973 | 742c | 2030 | 2c20 | 4c2c | 2055 | 292c | 0909 | 2520 | 4c69 |
| 2615500 | 7374 | 2063 | 6f6e | 7461 | 696e | 7320 | 616e | 2069 | 6e74 | 6567 | 6572 | 0a09 | 212c | 0a09 | 4c6f | 7765 | 7220 | 3d20 | 4c2c | 0a09 | 5570 | 7065 | 7220 | 3d20 |
| 2615560 | 552c | 0a09 | 6e75 | 6d6c | 6973 | 7431 | 284c | 2c20 | 552c | 204c | 6973 | 7429 | 2e0a | 6e75 | 6d6c | 6973 | 7428 | 4c6f | 7765 | 722c | 2055 | 7070 | 6572 | 2c20 |
| 2615640 | 4c69 | 7374 | 2920 | 3a2d | 0909 | 2520 | 6966 | 204c | 6f77 | 6572 | 206f | 7220 | 5570 | 7065 | 7220 | 6b6e | 6f77 | 6e2c | 2061 | 6e64 | 0a09 | 616e | 6368 | 6f72 |
| 2615720 | 284c | 6973 | 742c | 2030 | 2c20 | 4c65 | 6e67 | 7468 | 292c | 0925 | 204c | 6973 | 7420 | 6973 | 2070 | 726f | 7065 | 722c | 2074 | 6861 | 7427 | 7320 | 656e | 6f75 |
| 2616000 | 6768 | 2e0a | 0928 | 2020 | 2069 | 6e74 | 6567 | 6572 | 284c | 6f77 | 6572 | 292c | 2021 | 2c20 | 5570 | 7065 | 7220 | 6973 | 204c | 6f77 | 6572 | 2b4c | 656e | 6774 |
| 2616060 | 682d | 310a | 093b | 2020 | 2069 | 6e74 | 6567 | 6572 | 2855 | 7070 | 6572 | 292c | 2021 | 2c20 | 4c6f | 7765 | 7220 | 6973 | 2055 | 7070 | 6572 | 2d4c | 656e | 6774 |
| 2616140 | 682b | 310a | 0929 | 2c0a | 096e | 756d | 6c69 | 7374 | 3128 | 4c6f | 7765 | 722c | 2055 | 7070 | 6572 | 2c20 | 4c69 | 7374 | 292e | 0a6e | 756d | 6c69 | 7374 | 284c |
| 2616220 | 6f77 | 6572 | 2c20 | 5570 | 7065 | 722c | 204c | 6973 | 7429 | 203a | 2d0a | 0947 | 6f61 | 6c20 | 3d20 | 6e75 | 6d6c | 6973 | 7428 | 4c6f | 7765 | 722c | 5570 | 7065 |
| 2616300 | 722c | 4c69 | 7374 | 292c | 0a09 | 6d75 | 7374 | 5f62 | 655f | 696e | 7465 | 6765 | 7228 | 4c6f | 7765 | 722c | 2031 | 2c20 | 476f | 616c | 292c | 0a09 | 6d75 | 7374 |
| 2616360 | 5f62 | 655f | 696e | 7465 | 6765 | 7228 | 5570 | 7065 | 722c | 2032 | 2c20 | 476f | 616c | 292c | 0a09 | 6661 | 696c | 2e09 | 0909 | 2520 | 6e6f | 2073 | 7569 | 7461 |
| 2616440 | 626c | 6520 | 7479 | 7065 | 206e | 616d | 6520 | 666f | 7220 | 4c69 | 7374 | 2e0a | 0a0a | 2525 | 2020 | 616e | 6368 | 6f72 | 282b | 4c69 | 7374 | 2c20 | 2b4f | 6666 |
| 2616520 | 7365 | 742c | 202d | 4c6f | 7765 | 722c | 203f | 5570 | 7065 | 7229 | 0a25 | 2020 | 2073 | 7563 | 6365 | 6564 | 7320 | 7768 | 656e | 204c | 6973 | 7420 | 6973 | 2061 |
| 2616600 | 2070 | 726f | 7065 | 7220 | 6c69 | 7374 | 206f | 6620 | 6c65 | 6e67 | 7468 | 2055 | 7070 | 6572 | 2d4c | 6f77 | 6572 | 2b31 | 2061 | 6c6c | 206f | 660a | 2520 | 2020 |
| 2616660 | 7768 | 6f73 | 6520 | 656c | 656d | 656e | 7473 | 2061 | 7265 | 2069 | 6e74 | 6567 | 6572 | 7320 | 6f72 | 2076 | 6172 | 6961 | 626c | 6573 | 2c20 | 636f | 6e74 | 6169 |
| 2616740 | 6e69 | 6e67 | 2061 | 7420 | 6c65 | 6173 | 7420 | 6f6e | 650a | 2520 | 2020 | 696e | 7465 | 6765 | 722e | 2020 | 5468 | 6520 | 4c6f | 7765 | 7220 | 7661 | 6c75 | 6520 |
| 2617020 | 6973 | 206f | 6274 | 6169 | 6e65 | 6420 | 6672 | 6f6d | 2074 | 6865 | 2066 | 6972 | 7374 | 2069 | 6e74 | 6567 | 6572 | 2065 | 6c65 | 6d65 | 6e74 | 2c0a | 2520 | 2020 |
| 2617100 | 616e | 6420 | 7468 | 6520 | 5570 | 7065 | 7220 | 7661 | 6c75 | 6520 | 6672 | 6f6d | 2074 | 6865 | 206c | 656e | 6774 | 682e | 0a0a | 616e | 6368 | 6f72 | 282d | 2c20 |
| 2617160 | 5f2c | 205f | 2c20 | 5f29 | 203a | 2d20 | 212c | 2066 | 6169 | 6c2e | 0909 | 2520 | 7265 | 6a65 | 6374 | 2076 | 6172 | 6961 | 626c | 6573 | 0a61 | 6e63 | 686f | 7228 |
| 2617240 | 5b49 | 6e74 | 6567 | 6572 | 7c52 | 6573 | 745d | 2c20 | 4f66 | 6673 | 6574 | 2c20 | 4c6f | 7765 | 722c | 2055 | 7070 | 6572 | 2920 | 3a2d | 0a09 | 696e | 7465 | 6765 |
| 2617320 | 7228 | 496e | 7465 | 6765 | 7229 | 2c0a | 0921 | 2c0a | 094c | 6f77 | 6572 | 2069 | 7320 | 496e | 7465 | 6765 | 722d | 4f66 | 6673 | 6574 | 2c0a | 0961 | 6e63 | 686f |
| 2617400 | 7228 | 5265 | 7374 | 2c20 | 496e | 7465 | 6765 | 722c | 2055 | 7070 | 6572 | 292e | 0a61 | 6e63 | 686f | 7228 | 5b5f | 7c52 | 6573 | 745d | 2c20 | 4f66 | 6673 | 6574 |
| 2617460 | 2c20 | 4c6f | 7765 | 722c | 2055 | 7070 | 6572 | 2920 | 3a2d | 0a09 | 4e65 | 7874 | 2069 | 7320 | 4f66 | 6673 | 6574 | 2b31 | 2c0a | 0961 | 6e63 | 686f | 7228 | 5265 |
| 2617540 | 7374 | 2c20 | 4e65 | 7874 | 2c20 | 4c6f | 7765 | 722c | 2055 | 7070 | 6572 | 292e | 0a0a | 616e | 6368 | 6f72 | 282d | 2c20 | 5f2c | 205f | 2920 | 3a2d | 2021 | 2c20 |
| 2617620 | 6661 | 696c | 2e09 | 0925 | 2072 | 656a | 6563 | 7420 | 7661 | 7269 | 6162 | 6c65 | 730a | 616e | 6368 | 6f72 | 285b | 5d2c | 2055 | 7070 | 6572 | 2c20 | 5570 | 7065 |
| 2617700 | 7229 | 2e0a | 616e | 6368 | 6f72 | 285b | 5f7c | 5265 | 7374 | 5d2c | 204d | 2c20 | 5570 | 7065 | 7229 | 203a | 2d0a | 094e | 2069 | 7320 | 4d2b | 312c | 0a09 | 616e |
| 2617760 | 6368 | 6f72 | 2852 | 6573 | 742c | 204e | 2c20 | 5570 | 7065 | 7229 | 2e0a | 0a0a | 2525 | 2020 | 6e75 | 6d6c | 6973 | 7431 | 284c | 6f77 | 6572 | 2c20 | 5570 | 7065 |
| 2620040 | 722c | 204c | 6973 | 7429 | 0a25 | 2020 | 2069 | 7320 | 6361 | 6c6c | 6564 | 2077 | 6865 | 6e20 | 4c6f | 7765 | 7220 | 616e | 6420 | 5570 | 7065 | 7220 | 6172 | 6520 |
| 2620120 | 6b6e | 6f77 | 6e20 | 746f | 2062 | 6520 | 696e | 7465 | 6765 | 7273 | 2c20 | 616e | 6420 | 7765 | 2077 | 616e | 740a | 2520 | 2020 | 746f | 2075 | 6e69 | 6679 | 204c |
| 2620200 | 6973 | 7420 | 7769 | 7468 | 205b | 4c6f | 7765 | 722c | 2e2e | 2e2c | 5570 | 7065 | 725d | 2c20 | 6275 | 7420 | 7765 | 2064 | 6f20 | 6e6f | 7420 | 6b6e | 6f77 | 2077 |
| 2620260 | 6865 | 7468 | 6572 | 2074 | 6865 | 0a25 | 2020 | 204c | 6f77 | 6572 | 2061 | 6e64 | 2055 | 7070 | 6572 | 2076 | 616c | 7565 | 7320 | 6172 | 6520 | 696e | 206f | 7264 |
| 2620340 | 6572 | 206f | 7220 | 6e6f | 742e | 2020 | 4e6f | 7465 | 2074 | 6861 | 7420 | 6966 | 2055 | 7070 | 6572 | 2069 | 730a | 2520 | 2020 | 6c65 | 7373 | 2074 | 6861 | 6e20 |
| 2620420 | 4c6f | 7765 | 722d | 3120 | 7468 | 6572 | 6520 | 6973 | 206e | 6f20 | 736f | 6c75 | 7469 | 6f6e | 2066 | 6f72 | 204c | 6973 | 742e | 0a0a | 6e75 | 6d6c | 6973 | 7431 |
| 2620500 | 284c | 6f77 | 6572 | 2c20 | 5570 | 7065 | 722c | 204c | 6973 | 7429 | 203a | 2d0a | 0928 | 2020 | 204c | 6f77 | 6572 | 203d | 3c20 | 5570 | 7065 | 7220 | 2d3e | 206e |
| 2620560 | 756d | 6c69 | 7374 | 3228 | 4c6f | 7765 | 722c | 2055 | 7070 | 6572 | 2c20 | 4c69 | 7374 | 290a | 093b | 2020 | 204c | 6f77 | 6572 | 203d | 3a3d | 2055 | 7070 | 6572 |

| | | | | | | | | | | | | | | | | | | | | | | | | |
|---|---|---|---|---|---|---|---|---|---|---|---|---|---|---|---|---|---|---|---|---|---|---|---|---|
| 2620640 | 2b31 | 202d | 3e20 | 4c69 | 7374 | 203d | 205b | 5d0a | 0929 | 2e0a | 0a0a | 2525 | 2020 | 6e75 | 6d6c | 6973 | 7432 | 284c | 6f77 | 6572 | 2c20 | 5570 | 7065 | 722c |
| 2620720 | 204c | 6973 | 7429 | 0a25 | 2020 | 2069 | 7320 | 6361 | 6c6c | 6564 | 2077 | 6865 | 6e20 | 4c6f | 7765 | 7220 | 616e | 6420 | 5570 | 7065 | 7220 | 6172 | 6520 | 6b6e |
| 2621000 | 6f77 | 6e20 | 746f | 2062 | 6520 | 696e | 7465 | 6765 | 7273 | 0a25 | 2020 | 2077 | 6974 | 6820 | 4c6f | 7765 | 7220 | 3d3c | 2055 | 7070 | 6572 | 2c20 | 616e | 6420 |
| 2621060 | 7765 | 2077 | 616e | 7420 | 746f | 2075 | 6e69 | 6679 | 204c | 6973 | 7420 | 7769 | 7468 | 205b | 4c6f | 7765 | 722c | 2e2e | 2e2c | 5570 | 7065 | 725d | 2e0a | 0a6e |
| 2621140 | 756d | 6c69 | 7374 | 3228 | 4c6f | 7765 | 722c | 204c | 6f77 | 6572 | 2c20 | 4c69 | 7374 | 2920 | 3a2d | 2021 | 2c0a | 094c | 6973 | 7420 | 3d20 | 5b4c | 6f77 | 6572 |
| 2621220 | 5d2e | 0a6e | 756d | 6c69 | 7374 | 3228 | 4c6f | 7765 | 722c | 2055 | 7070 | 6572 | 2c20 | 5b4c | 6f77 | 6572 | 7c52 | 6573 | 745d | 2920 | 3a2d | 0a09 | 4e65 | 7874 |
| 2621300 | 2069 | 7320 | 4c6f | 7765 | 722b | 312c | 0a09 | 6e75 | 6d6c | 6973 | 7432 | 284e | 6578 | 742c | 2055 | 7070 | 6572 | 2c20 | 5265 | 7374 | 292e | 0a0a | 0100 | 08af |
| 2621360 | 0000 | 0697 | 0013 | 0b7d | 0013 | 0b6e | 0012 | eeb1 | 0013 | 0b86 | 0013 | 0b9d | 0013 | 0b85 | 0400 | 08af | 0000 | 065f | 0013 | 0ad1 | 0012 | eec1 | 0013 | 0395 |
| 2621440 | 0013 | 0b9d | 0013 | 0b86 | 0013 | 0a99 | 0013 | 0bb2 | 0013 | 0a79 | 0013 | 0bba | 0012 | e981 | 0013 | 0bc2 | 0012 | e981 | 0013 | 0bc2 | 0012 | e981 | 0013 | 0bc2 |
| 2621520 | 0013 | 0a39 | 0013 | 0bda | 0013 | 0a39 | 0013 | 0bda | 0013 | 0a39 | 0013 | 0bda | 0013 | 0a25 | 0013 | 0bf2 | 0013 | 0a11 | 0013 | 0bfa | 0013 | 09fd | 0013 | 0c02 |
| 2621600 | 0013 | 09fd | 0013 | 0c02 | 0013 | 09fd | 0013 | 0c02 | 0013 | 09e9 | 0013 | 0c1a | 0013 | 09d5 | 0013 | 0c22 | 0013 | 09c1 | 0013 | 0c2a | 0013 | 09c1 | 0013 | 0c2a |
| 2621660 | 0013 | 09c1 | 0013 | 0c2a | 0013 | 098d | 0013 | 0c42 | 0013 | 0979 | 0013 | 0c4a | 0013 | 0965 | 0013 | 0c52 | 0013 | 0965 | 0013 | 0c52 | 0013 | 0965 | 0013 | 0c52 |
| 2621740 | 0013 | 0931 | 0013 | 0c6a | 0013 | 091d | 0013 | 0c72 | 0013 | 0909 | 0013 | 0c7a | 0013 | 0909 | 0013 | 0c7a | 0013 | 0909 | 0013 | 0c7a | 0013 | 08d5 | 0013 | 0c92 |
| 2622020 | 0013 | 08c1 | 0013 | 0c9a | 0013 | 08ad | 0013 | 0ca2 | 0013 | 08ad | 0013 | 0ca2 | 0013 | 08a1 | 0013 | 0ca2 | 0013 | 0885 | 0013 | 0cba | 0013 | 0871 | 0013 | 0cc2 |
| 2622100 | 0013 | 085d | 0013 | 0cca | 0013 | 085d | 0013 | 0cca | 0013 | 085d | 0013 | 0cca | 0013 | 0811 | 0013 | 0ce2 | 0013 | 07fd | 0013 | 0cea | 0013 | 07fd | 0013 | 0cea |
| 2622160 | 0013 | 07fd | 0013 | 0cea | 0013 | 07e9 | 0013 | 0d02 | 0013 | 07d5 | 0013 | 0d0a | 0013 | 07c1 | 0013 | 0d12 | 0013 | 07c1 | 0013 | 0d2a | 0013 | 07d5 | 0013 | 0d32 |
| 2622240 | 0013 | 0d39 | 0013 | 0d02 | 0200 | 08af | 0000 | 06af | 0013 | 07f5 | 0100 | 08af | 0000 | 0ef3 | 0013 | 0d45 | 0013 | 0d5e | 0100 | 08af | 0000 | 0f93 | 0013 | 0d55 |
| 2622320 | 0013 | 0d72 | 0200 | 08af | 0000 | 1683 | 0013 | 07f5 | 0013 | 0465 | 0013 | 0d82 | 0100 | 08af | 0000 | 0ac3 | 0013 | 0d79 | 0013 | 0d92 | 0100 | 08af | 0000 | 0b23 |
| 2622400 | 0013 | 0d89 | 0013 | 0da2 | 0100 | 08af | 0000 | 0a23 | 0013 | 0199 | 0013 | 0db6 | 0200 | 08af | 0000 | 1173 | 0013 | 087d | 0013 | 0da9 | 0013 | 0dc6 | 0100 | 08af |
| 2622460 | 0000 | 1183 | 0013 | 0dbd | 0013 | 0dd6 | 0100 | 08af | 0000 | 0a33 | 0013 | 0dcd | 0013 | 0dea | 0200 | 08af | 0000 | 1173 | 0013 | 08cd | 0013 | 0ddd | 0013 | 0dfa |
| 2622540 | 0100 | 08af | 0000 | 1043 | 0013 | 0df1 | 0013 | 0e0a | 0100 | 08af | 0000 | 0a23 | 0013 | 0e01 | 0013 | 0e1e | 0200 | 08af | 0000 | 1173 | 0013 | 0929 | 0013 | 0e11 |
| 2622620 | 0013 | 0e2e | 0100 | 08af | 0000 | 1053 | 0013 | 0e25 | 0013 | 0e3e | 0100 | 08af | 0000 | 0a33 | 0013 | 0e35 | 0013 | 0e52 | 0200 | 08af | 0000 | 1173 | 0013 | 0985 |
| 2622700 | 0013 | 0e45 | 0013 | 0e62 | 0100 | 08af | 0000 | 1043 | 0013 | 0e59 | 0013 | 0e72 | 0100 | 08af | 0000 | 0a23 | 0013 | 0e69 | 0013 | 0e86 | 0200 | 08af | 0000 | 1173 |
| 2622760 | 0013 | 09e1 | 0013 | 0e79 | 0013 | 0e96 | 0100 | 08af | 0000 | 1053 | 0013 | 0e8d | 0013 | 0ea6 | 0100 | 08af | 0000 | 0a33 | 0013 | 0e9d | 0013 | 0eba | 0200 | 08af |
| 2623040 | 0000 | 1173 | 0013 | 0a1d | 0013 | 0ead | 0013 | 0eca | 0100 | 08af | 0000 | 1043 | 0013 | 0ec1 | 0013 | 0eda | 0100 | 08af | 0000 | 0313 | 0013 | 0ed1 | 0013 | 0ef2 |
| 2623120 | 0300 | 08af | 0000 | 0093 | 0012 | e991 | 0013 | 0345 | 0013 | 0ee1 | 0013 | 0f02 | 0100 | 08af | 0000 | 0333 | 0013 | 0ef9 | 0013 | 0f16 | 0200 | 08af | 0000 | 0643 |
| 2623200 | 0013 | 0ab1 | 0013 | 0f09 | 0013 | 0f2e | 0300 | 08af | 0000 | 1bb3 | 0012 | eec1 | 0013 | 0395 | 0013 | 0f1d | 0013 | 0f3e | 0100 | 08af | 0000 | 00e3 | 0013 | 0f35 |
| 2623260 | 0013 | 0f4e | 0100 | 08af | 0000 | 0673 | 0013 | 0f45 | 0013 | 0f5e | 0100 | 08af | 0000 | 0613 | 0013 | 0f55 | 0013 | 0f6e | 0100 | 08af | 0000 | 0793 | 0013 | 0f65 |
| 2623340 | 0013 | 0f82 | 0200 | 08af | 0000 | 0043 | 0012 | efc1 | 0013 | 0f75 | 0000 | 0007 | 0100 | 2167 | 005a | d663 | 0013 | 0f86 | 0013 | 0f9d | 0013 | 0f86 | 0400 | 08af |
| 2623420 | 0000 | 064f | 0013 | 0f55 | 0012 | f491 | 0013 | 0791 | 0013 | 0f9d | 0013 | 0f86 | 0013 | 0f9d | 0013 | 0f86 | 0013 | 0f9d | 0013 | 0f86 | 0013 | 0f35 | 0013 | 0fc2 |
| 2623500 | 0013 | 0f21 | 0013 | 0fca | 0013 | 0f01 | 0013 | 0fd2 | 0012 | f445 | 0013 | 0fda | 0013 | 0ef9 | 0013 | 0fe2 | 0012 | f3c1 | 0013 | 0fea | 0013 | 1001 | 0013 | 0fea |
| 2623560 | 0400 | 08af | 0000 | 0657 | 0013 | 0ef1 | 0012 | f3d1 | 0013 | 07b9 | 0013 | 1001 | 0013 | 0fea | 0012 | f35d | 0013 | 1016 | 0013 | 0e69 | 0013 | 101e | 0012 | f319 |
| 2623640 | 0013 | 1026 | 0012 | f1f9 | 0013 | 102e | 0013 | 1045 | 0013 | 102e | 0400 | 08af | 0000 | 0657 | 0013 | 0e61 | 0012 | f209 | 0013 | 07d9 | 0013 | 1045 | 0013 | 102e |
| 2623720 | 0013 | 0e29 | 0013 | 105a | 0012 | f145 | 0013 | 1062 | 0013 | 1079 | 0013 | 1062 | 0400 | 08af | 0000 | 0657 | 0013 | 0e21 | 0012 | f155 | 0013 | 0801 | 0013 | 1079 |
| 2624000 | 0013 | 1062 | 0013 | 01e9 | 0013 | 108e | 0012 | f091 | 0013 | 1096 | 0013 | 10ad | 0013 | 1096 | 0400 | 08af | 0000 | 0657 | 0013 | 0de1 | 0012 | f0a1 | 0013 | 0829 |
| 2624060 | 0013 | 10ad | 0013 | 1096 | 0013 | 0da9 | 0013 | 10c2 | 0012 | efdd | 0013 | 10ca | 0013 | 10e1 | 0013 | 10ca | 0400 | 08af | 0000 | 0657 | 0013 | 0da1 | 0012 | efed |
| 2624140 | 0013 | 0851 | 0013 | 10e1 | 0013 | 10ca | 0013 | 0d69 | 0013 | 10f6 | 0012 | ef29 | 0013 | 10fe | 0013 | 1115 | 0013 | 10fe | 0400 | 08af | 0000 | 0657 | 0013 | 0d61 |
| 2624220 | 0012 | ef39 | 0013 | 0879 | 0013 | 1115 | 0013 | 10fe | 0013 | 0d29 | 0013 | 112a | 0012 | eeb1 | 0013 | 1132 | 0013 | 0d09 | 0013 | 113a | 0013 | 0d09 | 0013 | 113a |
| 2624300 | 0013 | 0d09 | 0013 | 113a | 0013 | 0ce9 | 0013 | 1152 | 0013 | 0cc9 | 0013 | 115a | 0013 | 0ca9 | 0013 | 1162 | 0013 | 0c89 | 0013 | 116a | 0013 | 0c69 | 0013 | 1172 |
| 2624360 | 0013 | 1189 | 0013 | 1172 | 0200 | 08af | 0000 | 06b7 | 0013 | 0c81 | 0200 | 08af | 0000 | 1633 | 0013 | 0c81 | 0013 | 1195 | 0013 | 11b2 | 0100 | 08af | 0000 | 0ac3 |
| 2624440 | 0013 | 11a9 | 0013 | 11c6 | 0200 | 08af | 0000 | 0b43 | 0013 | 0cc1 | 0013 | 11b9 | 0013 | 11da | 0200 | 08af | 0000 | 0b93 | 0013 | 0ce1 | 0013 | 11cd | 0013 | 11ee |
| 2624520 | 0200 | 08af | 0000 | 0bd3 | 0013 | 0cf9 | 0013 | 11e1 | 0013 | 11fe | 0100 | 08af | 0000 | 0293 | 0013 | 11f5 | 0013 | 1216 | 0300 | 08af | 0000 | 0093 | 0012 | eec1 |
| 2624600 | 0013 | 08a1 | 0013 | 1205 | 0013 | 122a | 0200 | 08af | 0000 | 0643 | 0013 | 0d41 | 0013 | 121d | 0013 | 1242 | 0300 | 08af | 0000 | 0743 | 0012 | ef39 | 0013 | 0879 |
| 2624660 | 0013 | 1231 | 0013 | 1256 | 0200 | 08af | 0000 | 0643 | 0013 | 0d81 | 0013 | 1249 | 0013 | 126e | 0300 | 08af | 0000 | 0743 | 0012 | efed | 0013 | 0851 | 0013 | 125d |
| 2624740 | 0013 | 1282 | 0200 | 08af | 0000 | 0643 | 0013 | 0dc1 | 0013 | 1275 | 0013 | 129a | 0300 | 08af | 0000 | 0743 | 0012 | f0a1 | 0013 | 0829 | 0013 | 1289 | 0013 | 12aa |
| 2625020 | 0100 | 08af | 0000 | 0633 | 0013 | 12a1 | 0013 | 12c2 | 0300 | 08af | 0000 | 0743 | 0012 | f155 | 0013 | 0801 | 0013 | 12b1 | 0013 | 12d2 | 0100 | 08af | 0011 | 638c |
| 2625100 | 0300 | 1e37 | 0000 | 1e37 | 0000 | 000c | 0012 | b018 | 0012 | b05c | 0001 | 006d | 0000 | 0000 | 0011 | 3874 | 0100 | 6a3f | 0000 | 1e37 | 0000 | 0004 | 0012 | b1dc |
| 2625160 | 0012 | b1dc | 0001 | 006d | 0000 | 0000 | 0011 | 3908 | 0100 | 6347 | 0000 | 1e37 | 0000 | 0004 | 0012 | b124 | 0012 | b124 | 0001 | 006d | 0000 | 0000 | 0011 | 3958 |
| 2625240 | 0300 | 6a4f | 0000 | 1e37 | 0000 | 000c | 0013 | 3518 | 0012 | b404 | 0001 | 006d | 0000 | 0000 | 0011 | 5770 | 0100 | 2d4f | 0000 | 1e37 | 0000 | 0004 | 0012 | b2bc |
| 2625320 | 0012 | b2bc | 0001 | 006d | 0000 | 0000 | 0013 | 1484 | 0000 | 0090 | b288 | b66c | 0000 | 13d1 | 7fff | ffff | 001a | 40e8 | 0200 | 0db5 | 0100 | 15ad | 0100 | 33fd |
| 2625400 | 0000 | 000b | 0000 | 315f | 0013 | 13d4 | 0000 | 0038 | b27c | b66c | 0000 | 13d2 | 0000 | 13e9 | 0013 | 1488 | 0200 | 0db5 | 0500 | 1cdd | 0000 | 840f | 0000 | 000b |
| 2625460 | 0000 | 3287 | 00c9 | 54a3 | 0000 | 022b | 0000 | 315f | 0013 | 1484 | 0000 | 002c | b4f0 | b4e4 | 0000 | 13d1 | 7fff | ffff | 0008 | b0dd | 0000 | 0000 | 0000 | 0000 |
| 2625540 | 0013 | 1c89 | 0002 | 438a | 000a | d110 | 2c78 | 0084 | 0002 | 438a | 45dc | 247c | 000b | 3bc4 | 001c | 3348 | 3c48 | 0000 | 001a | 40ac | 0018 | 332c | 40f4 | 0000 |
| 2625620 | 001a | 4024 | 0014 | 3d30 | 44c4 | 0000 | 0100 | 53ef | 69b0 | 43c0 | 0200 | 0daf | 4b8c | 0000 | 0000 | 3287 | 6bf4 | 247c | 0008 | d47c | 0010 | 42ac | 0000 | 30b7 |
| 2625700 | 0011 | 3778 | 0010 | 247c | 0011 | 3798 | 0010 | 37dc | 447c | 0000 | 0200 | 0daf | 4b8c | 0000 | 0000 | 3287 | 4b8c | 0000 | 0000 | 5657 | 242c | 0000 | 0008 | d47c |

| | | | | | | | | | | | | | | | | | | | | | | | | |
|---|---|---|---|---|---|---|---|---|---|---|---|---|---|---|---|---|---|---|---|---|---|---|---|---|
| 2625760 | 0013 | 1578 | 0000 | 0070 | b27c | b66c | 0000 | 13d3 | 0000 | 13ea | 0013 | 14c0 | 0200 | 0db5 | 0500 | 1cdd | 0000 | 8b87 | 0000 | 000b | 0000 | 3287 | 00d1 | c5c3 |
| 2626040 | 0000 | 022b | 0000 | 315f | 0013 | 1578 | 0000 | 0036 | b27c | b66c | 0000 | 13d4 | 0000 | 13eb | 0013 | 157c | 0200 | 0db5 | 0500 | 1cdd | 0000 | 8b87 | 0000 | 0013 |
| 2626120 | 0000 | 3287 | 00d2 | 0563 | 0000 | 022b | 0000 | 315f | 2c78 | 0084 | 0002 | 438a | 2520 | 46d8 | 37dc | 247c | 0019 | d1c0 | 0014 | 2ba0 | 0014 | 0010 | 3b4c | 0000 |
| 2626200 | 000d | 21e0 | 0014 | 2c98 | 0016 | 2c58 | 4550 | 6d0c | 5370 | 42ac | 0000 | 8b8f | 0008 | c0fc | 0014 | 2e7c | ada8 | 2ba0 | 0014 | 002c | 44a0 | 0000 | 0100 | 83bf |
| 2626260 | 5fa0 | 43c0 | 0200 | 0daf | 4b8c | 0000 | 0000 | 3287 | 6bb4 | 247c | 0008 | db5c | 0014 | aa34 | 2e98 | 2c88 | 0004 | 2c58 | 447c | 0000 | 0100 | 83bf | 6d0c | 234c |
| 2626340 | 0012 | 0c40 | 0013 | 16d0 | 0000 | 0038 | b27c | b66c | 0000 | 13d5 | 0000 | 13ec | 0013 | 1684 | 0200 | 0db5 | 0500 | 1cdd | 0000 | 83bf | 0000 | 0013 | 0000 | 3287 |
| 2626420 | 00ce | 8e03 | 0000 | 022b | 0000 | 315f | 27f0 | 00d0 | 0019 | d580 | 2520 | 46d8 | 9294 | 9860 | 3348 | 247c | 0008 | cefc | 001c | 4550 | 4b8c | 0000 | 0000 | 0363 |
| 2626500 | 5370 | 4538 | 4b8c | 0000 | 0000 | 0323 | 6bb4 | 4550 | 4b8c | 0000 | 0000 | 0343 | 6b74 | 4538 | 4b8c | 0000 | 0000 | 03b3 | 6bb4 | 4568 | 4b8c | 0000 | 0000 | 0173 |
| 2626560 | 6b74 | 4539 | 4b8c | 0000 | 0000 | 0263 | 5370 | 4550 | 4b8c | 0000 | 0000 | 0223 | 6b74 | 4538 | 4b8c | 0000 | 0000 | 0243 | 6bb4 | 4550 | 4b8c | 0000 | 0000 | 02b3 |
| 2626640 | 6b74 | 4538 | 4b8c | 0000 | 0000 | 0173 | 6bb4 | 4550 | 6b74 | 5370 | 4538 | 6bf4 | 6bb4 | 4550 | 5370 | 6b74 | 32d4 | 247c | 000c | 4138 | 001c | 33bc | 3d48 | 408c |
| 2626720 | 000c | 4118 | 0014 | 3130 | 3b4c | 0000 | 0008 | cefc | 0010 | 39a4 | 000d | 21e0 | 000c | 2eb0 | 0013 | 1920 | 0000 | 0238 | b27c | b66c | 0000 | 13d6 | 0000 | 13ed |
| 2627000 | 0013 | 16bc | 0200 | 0db5 | 0500 | 1cdd | 0000 | 7a07 | 0000 | 0013 | 0000 | 3287 | 00d2 | 0123 | 0000 | 022b | 0000 | 315f | 0013 | 16f0 | 0000 | 0038 | b27c | b66c |
| 2627060 | 0000 | 13d7 | 0000 | 13ee | 0013 | 16f4 | 0200 | 0db5 | 0500 | 1cdd | 0000 | 8b97 | 0000 | 000b | 0000 | 3287 | 00ce | 3083 | 0000 | 022b | 0000 | 315f | 0013 | 1728 |
| 2627140 | 0000 | 0038 | b27c | b66c | 0000 | 13d8 | 0000 | 13ef | 0013 | 172c | 0200 | 0db5 | 0500 | 1cdd | 0000 | 8b97 | 0000 | 0013 | 0000 | 3287 | 00d2 | 21e3 | 0000 | 022b |
| 2627220 | 0000 | 315f | 0013 | 1760 | 0000 | 0038 | b27c | b66c | 0000 | 13d9 | 0000 | 13f0 | 0013 | 1764 | 0200 | 0db5 | 0500 | 1cdd | 0000 | 8b9f | 0000 | 000b | 0000 | 3287 |
| 2627300 | 00d2 | 2583 | 0000 | 022b | 0000 | 315f | 0013 | 1798 | 0000 | 0038 | b27c | b66c | 0000 | 13da | 0000 | 13f1 | 0013 | 179c | 0200 | 0db5 | 0500 | 1cdd | 0000 | 3d67 |
| 2627360 | 0000 | 0003 | 0000 | 3287 | 0059 | 4e23 | 0000 | 022b | 0000 | 315f | 0013 | 17d0 | 0000 | 0038 | b27c | b66c | 0000 | 13db | 0000 | 13f2 | 0013 | 17d4 | 0200 | 0db5 |
| 2627440 | 0500 | 1cdd | 0000 | 8ba7 | 0000 | 0003 | 0000 | 3287 | 00d2 | 2723 | 0000 | 022b | 0000 | 315f | 0013 | 1808 | 0000 | 0038 | b27c | b66c | 0000 | 13dc | 0000 | 13f3 |
| 2627520 | 0013 | 184c | 0200 | 0db5 | 0500 | 1cdd | 0000 | 8bb7 | 0000 | 0003 | 0000 | 3287 | 00d2 | 2923 | 0000 | 022b | 0000 | 315f | 0013 | 1848 | 0000 | 0040 | 0019 | cfb4 |
| 2627600 | 0019 | cf1c | 0019 | cda8 | 0019 | cc88 | 0019 | cce0 | 001a | 39d1 | 0019 | cc2c | 0019 | cc0c | 0019 | cb70 | 0019 | cb38 | 001a | 45c5 | 0000 | 0000 | 0000 | 0000 |
| 2627660 | 0000 | 0000 | 0013 | 1880 | 0000 | 0038 | b27c | b66c | 0000 | 13dd | 0000 | 13f4 | 0013 | 1884 | 0200 | 0db5 | 0500 | 1cdd | 0000 | 8baf | 0000 | 0003 | 0000 | 3287 |
| 2627740 | 00d2 | 2823 | 0000 | 022b | 0000 | 315f | 0013 | 1920 | 0000 | 0038 | b27c | b66c | 0000 | 13de | 0000 | 13f5 | 0013 | 1924 | 0200 | 0db5 | 0500 | 1cdd | 0000 | 8bc7 |
| 2630020 | 0000 | 0003 | 0000 | 3287 | 00d2 | 1fe3 | 0000 | 022b | 0000 | 315f | 2c78 | 0068 | 0002 | 438a | 2520 | 43e4 | 0200 | 696f | 5f8c | 43c0 | 0200 | 0daf | 4b8c | 0000 |
| 2630100 | 0000 | 3287 | 6bb4 | 247c | 0008 | db9c | 000c | 43e4 | 0300 | 695f | 5f78 | 43c0 | 0200 | 0daf | 4b8c | 0000 | 0000 | 3287 | 6bb4 | 247c | 0008 | db9c | 000c | 43e4 |
| 2630160 | 0300 | 6967 | 5f78 | 43c0 | 0200 | 0daf | 4b8c | 0000 | 0000 | 3287 | 6bb4 | 234c | 0008 | db9c | 0013 | 1984 | 0000 | 0038 | b27c | b66c | 0000 | 13df | 0000 | 13f6 |
| 2630240 | 0013 | 1988 | 0200 | 0db5 | 0500 | 1cdd | 0000 | 8bcf | 0000 | 0003 | 0000 | 3287 | 00d2 | 2fe3 | 0000 | 022b | 0000 | 315f | 2c78 | 002c | 0002 | 438a | 44a0 | 0000 |
| 2630320 | 0600 | 80c7 | 5fb4 | 0018 | 447c | 0000 | 0200 | 0daf | 4b8c | 0000 | 0000 | 3287 | 6bb4 | 22bc | 0008 | db9c | 0013 | 1a0c | 0000 | 0038 | b27c | b66c | 0000 | 13e0 |
| 2630400 | 0000 | 13f7 | 0013 | 1a10 | 0200 | 0db5 | 0500 | 1cdd | 0000 | 8bd7 | 0000 | 0003 | 0000 | 3287 | 00d2 | 3263 | 0000 | 022b | 0000 | 315f | 2c78 | 0050 | 0002 | 438a |
| 2630460 | 2520 | 247c | 001a | 466c | 000c | 43e4 | 0100 | 6b37 | 5fa0 | 43c0 | 0200 | 0daf | 4b8c | 0000 | 0000 | 3287 | 6bb4 | 247c | 0008 | db9c | 000c | 43e4 | 0100 | 5eef |
| 2630540 | 5fa0 | 43c0 | 0200 | 0daf | 4b8c | 0000 | 0000 | 3287 | 6bb4 | 234c | 0008 | db9c | 0013 | 1b48 | 0000 | 0070 | b27c | b66c | 0000 | 13e1 | 0000 | 13f8 | 0013 | 1a48 |
| 2630620 | 0200 | 0db5 | 0500 | 1cdd | 0000 | 8bdf | 0000 | 0003 | 0000 | 3287 | 00d2 | 3363 | 0000 | 022b | 0000 | 315f | 0013 | 1b48 | 0000 | 0038 | b27c | b66c | 0000 | 13e2 |
| 2630700 | 0000 | 13f9 | 0013 | 1b4c | 0200 | 0db5 | 0500 | 1cdd | 0000 | 8bbf | 0000 | 0003 | 0000 | 3287 | 00d2 | 2a23 | 0000 | 022b | 0000 | 315f | 2c78 | 00cc | 0002 | 438a |
| 2630760 | 2520 | 42ac | 0000 | 52b7 | 0010 | d38c | 000c | 42ac | 0000 | 5237 | 0010 | d38c | 000c | 42ac | 0000 | 1ff7 | 0010 | d38c | 000c | 42ac | 0000 | 32e7 | 0010 | d38c |
| 2631040 | 000c | 42ac | 0000 | 5ebf | 0010 | d38c | 000c | 42ac | 0000 | 5ec7 | 0010 | d38c | 000c | 42ac | 0000 | 5ecf | 0010 | d38c | 000c | 42ac | 0000 | 5ed7 | 0010 | d38c |
| 2631120 | 000c | 42ac | 0000 | 5edf | 0010 | d38c | 000c | 42ac | 0000 | 5347 | 0010 | d38c | 000c | 42ac | 0000 | 533f | 0010 | d38c | 000c | 42ac | 0000 | 52c7 | 0010 | d38c |
| 2631200 | 000c | 42ac | 0000 | 5ee7 | 0010 | d38c | 000c | 42ac | 0000 | 5eef | 0010 | d38c | 000c | 42ac | 0000 | 53ff | 0010 | d38c | 000c | 41d4 | 0000 | 5ef7 | 242c | 0000 |
| 2631260 | 0010 | d38c | 0013 | 1c7c | 0000 | 00f0 | b27c | b66c | 0000 | 13e3 | 0000 | 13fa | 0013 | 1b84 | 0200 | 0db5 | 0500 | 1cdd | 0000 | 8be7 | 0000 | 000b | 0000 | 3287 |
| 2631340 | 00d2 | 35a3 | 0000 | 022b | 0000 | 315f | 0013 | 1bb8 | 0000 | 0038 | b27c | b66c | 0000 | 13e4 | 0000 | 13fb | 0013 | 1c80 | 0200 | 0db5 | 0500 | 1cdd | 0000 | 8bef |
| 2631420 | 0000 | 000b | 0000 | 3287 | 00d2 | 3843 | 0000 | 022b | 0000 | 315f | 0013 | 1c7c | 0000 | 0080 | 0000 | 0000 | 0000 | 0000 | 0000 | 0000 | 0000 | 0000 | 0000 | 0000 |
| 2631500 | 0000 | 0000 | 0000 | 0000 | 0000 | 0000 | 0000 | 0000 | 0000 | 0000 | 001a | 3999 | 0000 | 0000 | 0000 | 0000 | 0000 | 0000 | 0000 | 0000 | 0000 | 0000 | 0019 | cfb4 |
| 2631560 | 0019 | cf1c | 0019 | cda8 | 0019 | cc88 | 0019 | cce0 | 001a | 39d1 | 0019 | cc2c | 0019 | cc0c | 0019 | cb70 | 0019 | cb38 | 0019 | c960 | 0019 | c824 | 0000 | 0000 |
| 2631640 | 0000 | 0000 | 2c78 | 0044 | 0002 | 438a | 45d0 | 3280 | 24d0 | 0000 | 001a | 46b4 | 0018 | 43c0 | 0200 | 0daf | 4b8c | 0000 | 0000 | 3287 | 6d94 | 247c | 0008 | b67c |
| 2631720 | 0014 | 329c | 24d0 | 0000 | 001a | 46b4 | 0014 | 3d30 | 3cf4 | 234c | 001a | 4728 | 0013 | 1d1c | 0000 | 0038 | b130 | b66c | 0000 | 13e5 | 0000 | 13fc | 0013 | 13d9 |
| 2632000 | 0200 | 0db5 | 0500 | 1cdd | 0000 | 5367 | 0000 | 0013 | 0000 | 3287 | 00d2 | 3943 | 0000 | 022b | 0000 | 315f | 2c78 | 0068 | 0002 | 438a | 2520 | a874 | a858 | 9db0 |
| 2632060 | aab4 | 03e8 | 9e0c | a164 | 2410 | 0000 | 0008 | d13c | 0010 | 247c | 0008 | d13c | 0010 | 42ac | 0000 | 8bf7 | 0008 | ec1c | 0010 | 247c | 0008 | d13c | 0010 | 37dc |
| 2632140 | 4300 | 0000 | 0000 | 8bff | 0008 | c0fc | 000c | 42ac | 0000 | 8bf7 | 0008 | ec1c | 000c | 247c | 0008 | d13c | 000c | 234c | 0008 | d13c | 0013 | 38e4 | 0000 | 165c |
| 2632220 | 0000 | 0000 | 0000 | 0000 | 0000 | 0000 | 0000 | 0000 | 0000 | 0000 | 0019 | cac8 | 0019 | cc2c | 0019 | cc0c | 0019 | cb70 | 0019 | cb38 | 001a | 4185 | 0019 | c824 |
| 2632300 | 0000 | 0000 | 0000 | 0000 | 0013 | 38e4 | 0000 | 161c | 6c74 | 686f | 7567 | 6820 | 6f6e | 6520 | 6f66 | 2074 | 6865 | 2061 | 7267 | 756d | 656e | 7473 | 206f | 6620 |
| 2632360 | 7468 | 6573 | 6520 | 726f | 7574 | 696e | 6573 | 2069 | 730a | 2020 | 2020 | 6465 | 7363 | 7269 | 6265 | 6420 | 6173 | 2061 | 2022 | 676f | 616c | 222c | 2077 | 6520 |
| 2632440 | 6172 | 6520 | 4e4f | 5420 | 676f | 696e | 6720 | 746f | 2063 | 616c | 6c20 | 6974 | 2c20 | 616e | 6420 | 6974 | 2077 | 6f75 | 6c64 | 0a20 | 2020 | 206f | 6e6c | 7920 |
| 2632520 | 6d61 | 6b65 | 2074 | 6869 | 6e67 | 7320 | 6d6f | 7265 | 206f | 6273 | 6375 | 7265 | 2074 | 6f20 | 6465 | 636c | 6172 | 6520 | 7468 | 6573 | 6520 | 7072 | 6564 | 6963 |
| 2632600 | 6174 | 6573 | 2061 | 730a | 2020 | 2020 | 6d65 | 7461 | 5f70 | 7265 | 6469 | 6361 | 7465 | 732e | 2020 | 5765 | 2061 | 7265 | 206a | 7573 | 7420 | 676f | 696e | 6720 |
| 2632660 | 746f | 2070 | 7269 | 6e74 | 2074 | 686f | 7365 | 2022 | 676f | 616c | 7322 | 2e0a | 2a2f | 0a0a | 3a2d | 206d | 6f64 | 756c | 6528 | 7479 | 7065 | 732c | 205b | 0a09 |
| 2632740 | 6361 | 6c6c | 6162 | 6c65 | 2f31 | 2c0a | 0963 | 6861 | 7273 | 2f31 | 2c0a | 2020 | 2020 | 2f2a | 0963 | 6f6d | 706c | 6578 | 2f31 | 2c09 | 0909 | 2520 | 666f | 7220 |
| 2633020 | 7468 | 6520 | 6675 | 7475 | 7265 | 092a | 2f0a | 0963 | 6f6d | 706f | 756e | 642f | 312c | 0a09 | 636f | 6e73 | 7461 | 6e74 | 2f31 | 2c0a | 0967 | 726f | 756e | 642f |

| | | | | | | | | | | | | | | | | | | | | | | | | |
|---|---|---|---|---|---|---|---|---|---|---|---|---|---|---|---|---|---|---|---|---|---|---|---|---|
| 2633100 | 312c | 0a09 | 7072 | 6f70 | 6572 | 5f6c | 6973 | 742f | 312c | 0a20 | 2020 | 202f | 2a09 | 7261 | 7469 | 6f6e | 616c | 2f31 | 2c09 | 0909 | 2520 | 666f | 7220 | 7468 |
| 2633160 | 6520 | 6675 | 7475 | 7265 | 092a | 2f0a | 0973 | 696d | 706c | 652f | 312c | 0a20 | 2020 | 202f | 2a09 | 7374 | 7269 | 6e67 | 2f31 | 2c09 | 0909 | 2520 | 666f | 7220 |
| 2633240 | 7468 | 6520 | 6675 | 7475 | 7265 | 092a | 2f0a | 0973 | 796d | 626f | 6c2f | 312c | 0a09 | 7465 | 726d | 5f74 | 7970 | 652f | 322c | 0a09 | 6d75 | 7374 | 5f62 | 652f |
| 2633320 | 332c | 0a09 | 6d75 | 7374 | 5f62 | 652f | 342c | 0a09 | 7368 | 6f75 | 6c64 | 5f62 | 652f | 332c | 0a09 | 7368 | 6f75 | 6c64 | 5f62 | 652f | 342c | 0a20 | 2020 | 202f |
| 2633400 | 2a09 | 0909 | 5448 | 4520 | 5245 | 5354 | 2041 | 5245 | 204f | 4253 | 4f4c | 4553 | 4345 | 4e54 | 0909 | 2a2f | 0a09 | 6d75 | 7374 | 5f62 | 655f | 6174 | 6f6d | 2f33 |
| 2633460 | 2c0a | 096d | 7573 | 745f | 6265 | 5f62 | 6574 | 7765 | 656e | 2f35 | 2c0a | 096d | 7573 | 745f | 6265 | 5f63 | 616c | 6c61 | 626c | 652f | 332c | 0a09 | 6d75 | 7374 |
| 2633540 | 5f62 | 655f | 6368 | 6172 | 732f | 332c | 0a09 | 6d75 | 7374 | 5f62 | 655f | 636f | 6d70 | 6f75 | 6e64 | 2f33 | 2c0a | 096d | 7573 | 745f | 6265 | 5f63 | 6f6e | 7374 |
| 2633620 | 616e | 742f | 332c | 0a09 | 6d75 | 7374 | 5f62 | 655f | 6772 | 6f75 | 6e64 | 2f33 | 2c0a | 096d | 7573 | 745f | 6265 | 5f69 | 6e74 | 6567 | 6572 | 2f33 | 2c0a | 096d |
| 2633700 | 7573 | 745f | 6265 | 5f6e | 6f6e | 6e65 | 672f | 332c | 0a09 | 6d75 | 7374 | 5f62 | 655f | 6e6f | 6e76 | 6172 | 2f33 | 2c0a | 096d | 7573 | 745f | 6265 | 5f6e | 756d |
| 2633760 | 6265 | 722f | 332c | 0a09 | 6d75 | 7374 | 5f62 | 655f | 6f6e | 656f | 662f | 342c | 0a09 | 6d75 | 7374 | 5f62 | 655f | 7072 | 6f70 | 6572 | 5f6c | 6973 | 742f | 332c |
| 2634040 | 0a09 | 6d75 | 7374 | 5f62 | 655f | 7379 | 6162 | 6f6c | 2f33 | 2c0a | 096d | 7573 | 745f | 6265 | 5f76 | 6172 | 2f33 | 0a20 | 2020 | 5d29 | 2e0a | 0a73 | 6363 | 735f |
| 2634120 | 6964 | 2827 | 2240 | 2823 | 2938 | 392f | 3039 | 2f31 | 3120 | 7479 | 7065 | 732e | 706c | 0933 | 342e | 3222 | 2729 | 2e0a | 0a0a | 0a63 | 616c | 6c61 | 626c | 6528 |
| 2634200 | 5465 | 726d | 2920 | 3a2d | 0a09 | 6e6f | 6e76 | 6172 | 2854 | 6572 | 6d29 | 2c0a | 0966 | 756e | 6374 | 6f72 | 2854 | 6572 | 6d2c | 2053 | 796d | 626f | 6c2c | 205f |
| 2634260 | 4172 | 6974 | 7929 | 2c0a | 0961 | 746f | 6d28 | 5379 | 6d62 | 6f6c | 292e | 0a0a | 0a63 | 6f6d | 706f | 756e | 6428 | 5465 | 726d | 2920 | 3a2d | 0a09 | 6e6f | 6e76 |
| 2634340 | 6172 | 2854 | 6572 | 6d29 | 2c0a | 0966 | 756e | 6374 | 6f72 | 2854 | 6572 | 6d2c | 205f | 5379 | 6d62 | 6f6c | 2c20 | 4172 | 6974 | 7929 | 2c0a | 0941 | 7269 | 7479 |
| 2634420 | 203e | 2030 | 2e0a | 0a0a | 636f | 6e73 | 7461 | 6e74 | 2854 | 6572 | 6d29 | 203a | 2d09 | 0909 | 2520 | 5072 | 6f62 | 6162 | 6c79 | 2074 | 6865 | 2073 | 616d | 6520 |
| 2634500 | 6173 | 2061 | 746f | 6d69 | 6328 | 5465 | 726d | 292c | 0a09 | 6e6f | 6e76 | 6172 | 2854 | 6572 | 6d29 | 2c09 | 0909 | 2520 | 6275 | 7420 | 4927 | 6d20 | 706c | 6179 |
| 2634560 | 696e | 6720 | 7361 | 6665 | 2068 | 6572 | 652e | 0a09 | 6675 | 6e63 | 746f | 7228 | 5465 | 726d | 2c20 | 5465 | 726d | 2c20 | 3029 | 2e09 | 0925 | 2061 | 746f | 6d69 |
| 2634640 | 6320 | 7761 | 7320 | 6465 | 6669 | 6e65 | 6420 | 6173 | 2069 | 6e74 | 6567 | 6572 | 7c61 | 746f | 6d0a | 0a0a | 6772 | 6f75 | 6e64 | 2854 | 6572 | 6d29 | 203a | 2d0a |
| 2634720 | 096e | 6f6e | 7661 | 7228 | 5465 | 726d | 292c | 0a09 | 6675 | 6e63 | 746f | 7228 | 5465 | 726d | 2c20 | 5f2c | 2041 | 7269 | 7479 | 292c | 0a09 | 6772 | 6f75 | 6e64 |
| 2635000 | 2841 | 7269 | 7479 | 2c20 | 5465 | 726d | 292e | 0a0a | 6772 | 6f75 | 6e64 | 284e | 2c20 | 5465 | 726d | 2920 | 3a2d | 0a20 | 2020 | 2028 | 094e | 203d | 3a3d | 2030 |
| 2635060 | 202d | 3e20 | 7472 | 7565 | 0a20 | 2020 | 203b | 0961 | 7267 | 284e | 2c20 | 5465 | 726d | 2c20 | 4172 | 6729 | 2c0a | 096e | 6f6e | 7661 | 7228 | 4172 | 6729 | 2c0a |
| 2635140 | 0966 | 756e | 6374 | 6f72 | 2841 | 7267 | 2c20 | 5f2c | 2041 | 7269 | 7479 | 292c | 0a09 | 6772 | 6f75 | 6e64 | 2841 | 7269 | 7479 | 2c20 | 4172 | 6729 | 2c0a | 094d |
| 2635220 | 2069 | 7320 | 4e2d | 312c | 0a09 | 6772 | 6f75 | 6e64 | 284d | 2c20 | 5465 | 726d | 290a | 2020 | 2020 | 292e | 0a0a | 0a70 | 726f | 7065 | 725f | 6c69 | 7374 | 282a |
| 2635300 | 2920 | 3a2d | 2021 | 2c20 | 6661 | 696c | 2e09 | 0925 | 2063 | 6174 | 6368 | 6573 | 2076 | 6172 | 6961 | 626c | 6573 | 0a70 | 726f | 7065 | 725f | 6c69 | 7374 | 285b |
| 2635360 | 5d29 | 2e0a | 7072 | 6f70 | 6572 | 5f6c | 6973 | 7428 | 5b5f | 7c4c | 5d29 | 203a | 2d0a | 0970 | 726f | 7065 | 725f | 6c69 | 7374 | 284c | 292e | 0a0a | 0a73 | 696d |
| 2635440 | 706c | 6528 | 5465 | 726d | 2920 | 3a2d | 0a20 | 2020 | 2028 | 0976 | 6172 | 2854 | 6572 | 6d29 | 202d | 3e20 | 7472 | 7565 | 0a20 | 2020 | 203b | 0966 | 756e | 6374 |
| 2635520 | 6f72 | 2854 | 6572 | 6d2c | 2054 | 6572 | 6d2c | 2030 | 290a | 2020 | 2020 | 292e | 0a0a | 0a73 | 796d | 626f | 6c28 | 5465 | 726d | 2920 | 3a2d | 0a09 | 6174 | 6f6d |
| 2635600 | 2854 | 6572 | 6d29 | 2e0a | 0a0a | 2520 | 2020 | 7465 | 726d | 5f74 | 7970 | 6528 | 2b54 | 6572 | 6d2c | 203f | 5479 | 7065 | 290a | 2520 | 2020 | 6973 | 2061 | 2074 |
| 2635660 | 7970 | 6520 | 7465 | 7374 | 696e | 6720 | 7072 | 6564 | 6963 | 6174 | 6520 | 6465 | 7369 | 676e | 6564 | 2066 | 6f72 | 2069 | 6e63 | 6f72 | 706f | 7261 | 7469 | 6f6e |
| 2635740 | 2069 | 6e74 | 6f20 | 636f | 726f | 7574 | 696e | 696e | 670a | 2520 | 2020 | 5072 | 6f6c | 6f67 | 7320 | 6c69 | 6b65 | 204d | 5520 | 5072 | 6f6c | 6f67 | 2061 | 6e64 |
| 2636020 | 204e | 5520 | 5072 | 6f6c | 6f67 | 2e20 | 2049 | 6e20 | 6765 | 6e65 | 7261 | 6c2c | 2074 | 6865 | 2072 | 756c | 6520 | 6973 | 2074 | 6861 | 7420 | 7768 | 656e | 0a25 |
| 2636100 | 2020 | 2061 | 2070 | 7265 | 6469 | 6361 | 7465 | 202a | 776f | 756c | 642a | 2064 | 656c | 6179 | 2069 | 6e20 | 6120 | 636f | 726f | 7574 | 696e | 696e | 6720 | 7379 |
| 2636160 | 7374 | 656d | 2c20 | 6974 | 202a | 6d75 | 7374 | 2a20 | 7265 | 706f | 7274 | 2061 | 6e0a | 2520 | 2020 | 696e | 7374 | 616e | 7469 | 6174 | 696f | 6e20 | 6661 | 756c |
| 2636240 | 7420 | 696e | 2061 | 206e | 6f6e | 2d63 | 6f72 | 6f75 | 7469 | 6e69 | 6e67 | 2073 | 7973 | 7465 | 6d20 | 6c69 | 6b65 | 2051 | 7569 | 6e74 | 7573 | 2050 | 726f | 6c6f |
| 2636320 | 672e | 0a25 | 2020 | 2054 | 6869 | 7320 | 7072 | 6564 | 6963 | 6174 | 6520 | 6973 | 206e | 6f20 | 6578 | 6365 | 7074 | 696f | 6e3a | 2074 | 6865 | 2054 | 6572 | 6d20 |
| 2636400 | 6d75 | 7374 | 2062 | 6520 | 696e | 7374 | 616e | 7469 | 6174 | 6564 | 2077 | 6865 | 6e20 | 796f | 750a | 2520 | 2020 | 6361 | 6c6c | 2074 | 6572 | 6d5f | 7479 | 7065 |
| 2636460 | 2f32 | 2062 | 6563 | 6175 | 7365 | 206b | 6e6f | 7769 | 6e67 | 2074 | 6865 | 2054 | 7970 | 6520 | 646f | 6573 | 6e27 | 7420 | 6769 | 7665 | 2079 | 6f75 | 2065 | 6e6f |
| 2636540 | 7567 | 680a | 2520 | 2020 | 696e | 666f | 726d | 6174 | 696f | 6e20 | 746f | 2072 | 6563 | 6f6e | 7374 | 7275 | 6374 | 2074 | 6865 | 2054 | 6572 | 6d2e | 2020 | 4966 |
| 2636620 | 2079 | 6f75 | 2073 | 7570 | 706c | 7920 | 7468 | 6520 | 5479 | 7065 | 2c20 | 6173 | 2069 | 6e0a | 2520 | 2020 | 7465 | 726d | 5f74 | 7970 | 6528 | 582c | 2063 | 6f6e |
| 2636700 | 7374 | 616e | 7429 | 2c20 | 7468 | 6973 | 2069 | 7320 | 6120 | 7065 | 7266 | 6563 | 746c | 7920 | 676f | 6f64 | 206c | 6f67 | 6963 | 616c | 2074 | 6573 | 742e | 2020 |
| 2636760 | 4974 | 2069 | 730a | 2520 | 2020 | 6e6f | 7420 | 6173 | 2066 | 6173 | 7420 | 6173 | 2061 | 746f | 6d69 | 6328 | 5829 | 2077 | 6f75 | 6c64 | 2062 | 652c | 2062 | 7574 |
| 2637040 | 2069 | 7420 | 6973 | 2022 | 736f | 756e | 6422 | 2e20 | 2049 | 6e20 | 6f72 | 6465 | 7220 | 746f | 0a25 | 2020 | 2070 | 7265 | 7365 | 7276 | 6520 | 7468 | 6520 | 6c6f |
| 2637120 | 6769 | 6361 | 6c20 | 6368 | 6172 | 6163 | 7465 | 7220 | 6f66 | 2074 | 6869 | 7320 | 7072 | 6564 | 6963 | 6174 | 652c | 2069 | 6620 | 796f | 7520 | 6c65 | 6176 | 6520 |
| 2637200 | 5479 | 7065 | 0a25 | 2020 | 2075 | 6e62 | 6f75 | 6e64 | 2c20 | 616c | 6c20 | 7468 | 6520 | 7479 | 7065 | 7320 | 7768 | 6963 | 6920 | 5465 | 726d | 2068 | 6173 | 2077 |
| 2637260 | 696c | 6c20 | 6265 | 2065 | 6e75 | 6d65 | 7261 | 7465 | 642e | 0a0a | 7465 | 726d | 5f74 | 7970 | 6528 | 5465 | 726d | 2c20 | 5479 | 7065 | 2920 | 3a2d | 0a09 | 2820 |
| 2637340 | 2020 | 7661 | 7228 | 5465 | 726d | 2920 | 202d | 3e20 | 696e | 7374 | 616e | 7469 | 6174 | 696f | 6e5f | 6661 | 756c | 7428 | 312c | 2074 | 6572 | 6d5f | 7479 | 7065 |
| 2637420 | 2854 | 6572 | 6d2c | 5479 | 7065 | 2929 | 0a09 | 3b20 | 2020 | 6174 | 6f6d | 2854 | 7970 | 6529 | 202d | 3e20 | 7465 | 726d | 5f74 | 7970 | 655f | 2854 | 7970 | 652c |
| 2637500 | 2054 | 6572 | 6d29 | 0a09 | 3b20 | 2020 | 7661 | 7228 | 5479 | 7065 | 2920 | 202d | 3e20 | 7465 | 726d | 5f74 | 7970 | 655f | 2854 | 7970 | 652c | 2054 | 6572 | 6d29 |
| 2637560 | 0a09 | 3b20 | 2020 | 7368 | 6f75 | 6c64 | 5f62 | 6528 | 7379 | 6d62 | 6f6c | 2c20 | 5479 | 7065 | 2c20 | 322c | 2074 | 6572 | 6d5f | 7479 | 7065 | 2854 | 6572 | 6d2c |
| 2637640 | 5479 | 7065 | 2929 | 0a09 | 292e | 0a0a | 0a74 | 6572 | 6d5f | 7479 | 7065 | 5f28 | 636f | 6d70 | 6f75 | 6e64 | 2c20 | 5465 | 726d | 2920 | 3a2d | 2063 | 6f6d | 706f |
| 2637720 | 756e | 6428 | 5465 | 726d | 292e | 0a74 | 6572 | 6d5f | 7479 | 7065 | 5f28 | 6361 | 6c6c | 6162 | 6c65 | 2c20 | 5465 | 726d | 2920 | 3a2d | 2063 | 616c | 6c61 | 626c |
| 2640000 | 6528 | 5465 | 726d | 292e | 0a74 | 6572 | 6d5f | 7479 | 7065 | 5f28 | 636f | 6e73 | 7461 | 6e74 | 2c20 | 5465 | 726d | 2920 | 3a2d | 2061 | 746f | 6d69 | 6328 | 5465 |
| 2640060 | 726d | 292e | 0a74 | 6572 | 6d5f | 7479 | 7065 | 5f28 | 6e75 | 6d62 | 6572 | 2c20 | 2020 | 5465 | 726d | 2920 | 3a2d | 206e | 756d | 6265 | 7228 | 5465 | 726d | 292e |
| 2640140 | 0a74 | 6572 | 6d5f | 7479 | 7065 | 5f28 | 7379 | 6d62 | 6f6c | 2c20 | 2020 | 5465 | 726d | 2920 | 3a2d | 2061 | 746f | 6d28 | 5465 | 726d | 292e | 0a25 | 2020 | 2020 |

| | | | | | | | | | | | | | | | | | | | | | | | | |
|---|---|---|---|---|---|---|---|---|---|---|---|---|---|---|---|---|---|---|---|---|---|---|---|---|
| 2640220 | 2020 | 2020 | 2028 | 7374 | 7269 | 6e67 | 2c20 | 2020 | 5465 | 726d | 2920 | 3a2d | 2073 | 7472 | 696e | 6728 | 5465 | 726d | 292e | 0a74 | 6572 | 6d5f | 7479 | 7065 |
| 2640300 | 5f28 | 696e | 7465 | 6765 | 722c | 2020 | 5465 | 726d | 2920 | 3a2d | 2069 | 6e74 | 6567 | 6572 | 2854 | 6572 | 6d29 | 2e0a | 2520 | 2020 | 2020 | 2020 | 2020 | 2872 |
| 2640360 | 6174 | 696f | 6e61 | 6c2c | 2054 | 6572 | 6d29 | 203a | 2d20 | 7261 | 7469 | 6f6e | 616c | 2854 | 6572 | 6d29 | 2e0a | 7465 | 726d | 5f74 | 7970 | 655f | 2866 | 6c6f |
| 2640440 | 6174 | 2c20 | 2020 | 2054 | 6572 | 6d29 | 203a | 2d20 | 666c | 6f61 | 7428 | 5465 | 726d | 292e | 0a25 | 2020 | 2020 | 2020 | 2020 | 2028 | 636f | 6d70 | 6c65 | 782c |
| 2640520 | 2020 | 5465 | 726d | 2920 | 3a2d | 2063 | 6f6d | 706c | 6578 | 2854 | 6572 | 6d29 | 2e0a | 0a0a | 0a25 | 2020 | 2063 | 6861 | 7273 | 2d2b | 5465 | 726d | 290a | 2520 |
| 2640600 | 2020 | 6973 | 2074 | 7275 | 6520 | 7768 | 656e | 2054 | 6572 | 6d20 | 6973 | 2061 | 2070 | 726f | 7065 | 7220 | 6c69 | 7374 | 206f | 6620 | 4953 | 4f20 | 3838 | 3539 |
| 2640660 | 2d31 | 206f | 7220 | 4542 | 4344 | 4943 | 2063 | 6861 | 7261 | 6374 | 6572 | 2063 | 6f64 | 6573 | 2e0a | 2520 | 2020 | 446f | 206e | 6f74 | 2063 | 6f6e | 6675 | 7365 |
| 2640740 | 2069 | 7420 | 7769 | 7468 | 2069 | 735f | 6368 | 6172 | 732f | 3120 | 696e | 206c | 6962 | 7261 | 7279 | 2870 | 7269 | 6e74 | 5f63 | 6861 | 7273 | 292e | 2020 | 416e |
| 2641020 | 7920 | 7469 | 6d65 | 2077 | 650a | 2520 | 2020 | 7361 | 7920 | 7468 | 6174 | 2073 | 6f6d | 6574 | 6869 | 6e67 | 2069 | 7320 | 6f72 | 2073 | 686f | 756c | 6420 | 6265 |
| 2641100 | 2061 | 2022 | 6368 | 6172 | 7322 | 2c20 | 5f74 | 6869 | 735f | 2069 | 7320 | 7768 | 6174 | 2077 | 6520 | 6d65 | 616e | 2e0a | 0a63 | 6861 | 7273 | 282a | 2920 | 3a2d |
| 2641160 | 2021 | 2c20 | 6661 | 696c | 2e0a | 6368 | 6172 | 7328 | 5b5d | 292e | 0a63 | 6861 | 7273 | 285b | 4368 | 6172 | 7c43 | 6861 | 7273 | 5d29 | 203a | 2d0a | 0969 | 6e74 |
| 2641240 | 6567 | 6572 | 2843 | 6861 | 7229 | 2c0a | 0943 | 6861 | 7220 | 3e3d | 2030 | 2c20 | 4368 | 6172 | 203d | 3c20 | 3235 | 352c | 0a09 | 6368 | 6172 | 7328 | 4368 | 6172 |
| 2641320 | 7329 | 2e0a | 0a0a | 252d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d |
| 2641400 | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2b0a | 2520 | 2020 | 5468 | 6520 | 666f | 6c6c | 6f77 | 696e |
| 2641460 | 6720 | 7072 | 6564 | 6963 | 6174 | 6573 | 2061 | 7265 | 2072 | 6574 | 6169 | 6e65 | 6420 | 666f | 7220 | 6261 | 636b | 7761 | 7264 | 7320 | 636f | 6d70 | 6174 | 6962 |
| 2641540 | 696c | 6974 | 792e | 097c | 0a25 | 2020 | 204e | 6f20 | 6e65 | 7720 | 7072 | 6564 | 6963 | 6174 | 6573 | 206f | 6620 | 7468 | 6973 | 2066 | 6f72 | 6d20 | 7368 | 6f75 |
| 2641620 | 6c64 | 2062 | 6520 | 7772 | 6974 | 7465 | 6e2c | 2061 | 6e64 | 2074 | 6865 | 7365 | 206f | 6e65 | 7309 | 7c0a | 2520 | 2020 | 7769 | 6c6c | 2062 | 6520 | 7265 | 6d6f |
| 2641700 | 7665 | 6420 | 6672 | 6f6d | 2074 | 6865 | 206c | 6962 | 7261 | 7279 | 2062 | 7920 | 332e | 3520 | 6174 | 2074 | 6865 | 206c | 6174 | 6573 | 742e | 0909 | 7c0a | 252d |
| 2641760 | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d | 2d2d |
| 2642040 | 2d2d | 2d2d | 2d2d | 2d2d | 2d2d | 2d2d | 2d2d | 2d2d | 2d2d | 2d2d | 2d2d | 2b0a | 0a6d | 7573 | 745f | 6265 | 5f61 | 746f | 6d28 | 4172 | 672c | 204e | 2c20 | 476f |
| 2642120 | 616c | 2920 | 3a2d | 0a09 | 6d75 | 7374 | 5f62 | 6528 | 6174 | 6f6d | 2c20 | 4172 | 672c | 204e | 2c20 | 476f | 616c | 292e | 0a0a | 6d75 | 7374 | 5f62 | 655f | 6265 |
| 2642200 | 7477 | 6565 | 6e28 | 4c2c | 2055 | 2c20 | 4172 | 672c | 204e | 2c20 | 476f | 616c | 2920 | 3a2d | 0a09 | 6d75 | 7374 | 5f62 | 6528 | 6265 | 7477 | 6565 | 6e28 | 4c2c |
| 2642260 | 5529 | 2c20 | 4172 | 672c | 204e | 2c20 | 476f | 616c | 292e | 0a0a | 6d75 | 7374 | 5f62 | 655f | 6361 | 6c6c | 6162 | 6c65 | 2841 | 7267 | 2c20 | 4e2c | 2047 | 6f61 |
| 2642340 | 6c29 | 203a | 2d0a | 096d | 7573 | 745f | 6265 | 2863 | 616c | 6c61 | 626c | 652c | 2041 | 7267 | 2c20 | 4e2c | 2047 | 6f61 | 6c29 | 2e0a | 0a6d | 7573 | 745f | 6265 |
| 2642420 | 5f63 | 6861 | 7273 | 2841 | 7267 | 2c20 | 4e2c | 2047 | 6f61 | 6c29 | 203a | 2d0a | 096d | 7573 | 745f | 6265 | 2863 | 6861 | 7273 | 2c20 | 4172 | 672c | 204e | 2c20 |
| 2642500 | 476f | 616c | 292e | 0a0a | 6d75 | 7374 | 5f62 | 655f | 636f | 6170 | 6f75 | 6e64 | 2841 | 7267 | 2c20 | 4e2c | 2047 | 6f61 | 6c29 | 203a | 2d0a | 096d | 7573 | 745f |
| 2642560 | 6265 | 2863 | 6f6d | 706f | 756e | 642c | 2041 | 7267 | 2c20 | 4e2c | 2047 | 6f61 | 6c29 | 2e0a | 0a6d | 7573 | 745f | 6265 | 5f63 | 6f6e | 7374 | 616e | 7428 | 4172 |
| 2642640 | 672c | 204e | 2c20 | 476f | 616c | 2920 | 3a2d | 0a09 | 6d75 | 7374 | 5f62 | 6528 | 636f | 6e73 | 7461 | 6e74 | 2c20 | 4172 | 672c | 204e | 2c20 | 476f | 616c | 292e |
| 2642720 | 0a0a | 6d75 | 7374 | 5f62 | 655f | 6772 | 6f75 | 6e64 | 2841 | 7267 | 2c20 | 4e2c | 2047 | 6f61 | 6c29 | 203a | 2d0a | 096d | 7573 | 745f | 6265 | 2867 | 726f | 756e |
| 2643000 | 642c | 2041 | 7267 | 2c20 | 4e2c | 2047 | 6f61 | 6c29 | 2e0a | 0a6d | 7573 | 745f | 6265 | 5f69 | 6e74 | 6567 | 6572 | 2841 | 7267 | 2c20 | 4e2c | 2047 | 6f61 | 6c29 |
| 2643060 | 203a | 2d0a | 096d | 7573 | 745f | 6265 | 2869 | 6e74 | 6567 | 6572 | 2c20 | 4172 | 672c | 204e | 2c20 | 476f | 616c | 292e | 0a0a | 6d75 | 7374 | 5f62 | 655f | 6e6f |
| 2643140 | 6e6e | 6567 | 2841 | 7267 | 2c20 | 4e2c | 2047 | 6f61 | 6c29 | 203a | 2d0a | 096d | 7573 | 745f | 6265 | 286e | 6f6e | 6e65 | 672c | 2041 | 7267 | 2c20 | 4e2c | 2047 |
| 2643220 | 6f61 | 6c29 | 2e0a | 0a6d | 7573 | 745f | 6265 | 5f6e | 6f6e | 7661 | 7228 | 4172 | 672c | 204e | 2c20 | 476f | 616c | 2920 | 3a2d | 0a09 | 6d75 | 7374 | 5f62 | 6528 |
| 2643300 | 6e6f | 6e76 | 6172 | 2c20 | 4172 | 672c | 204e | 2c20 | 476f | 616c | 292e | 0a0a | 6d75 | 7374 | 5f62 | 655f | 6e75 | 6d62 | 6572 | 2841 | 7267 | 2c20 | 4e2c | 2047 |
| 2643360 | 6f61 | 6c29 | 203a | 2d0a | 096d | 7573 | 745f | 6265 | 286e | 756d | 6265 | 722c | 2041 | 7267 | 2c20 | 4e2c | 2047 | 6f61 | 6c29 | 2e0a | 0a6d | 7573 | 745f | 6265 |
| 2643440 | 5f6f | 6e65 | 6f66 | 2841 | 7267 | 2c20 | 4c69 | 7374 | 2c20 | 4e2c | 2047 | 6f61 | 6c29 | 203a | 2d0a | 096d | 7573 | 745f | 6265 | 286f | 6e65 | 6f66 | 284c | 6973 |
| 2643520 | 7429 | 2c20 | 4172 | 672c | 204e | 2c20 | 476f | 616c | 292e | 0a0a | 6d75 | 7374 | 5f62 | 655f | 7072 | 6f70 | 6572 | 5f6c | 6973 | 7428 | 4172 | 672c | 204e | 2c20 |
| 2643600 | 476f | 616c | 2920 | 3a2d | 0a09 | 6d75 | 7374 | 5f62 | 6528 | 7072 | 6f70 | 6572 | 5f6c | 6973 | 742c | 2041 | 7267 | 2c20 | 4e2c | 2047 | 6f61 | 6c29 | 2e0a | 0a6d |
| 2643660 | 7573 | 745f | 6265 | 5f73 | 796d | 626f | 6c28 | 4172 | 672c | 204e | 2c20 | 476f | 616c | 2920 | 3a2d | 0a09 | 6d75 | 7374 | 5f62 | 6528 | 7379 | 6d62 | 6f6c | 2c20 |
| 2643740 | 4172 | 672c | 204e | 2c20 | 476f | 616c | 292e | 0a0a | 6d75 | 7374 | 5f62 | 655f | 7661 | 7228 | 4172 | 672c | 204e | 2c20 | 476f | 616c | 2920 | 3a2d | 0a09 | 6d75 |
| 2644020 | 7374 | 5f62 | 6528 | 7661 | 722c | 2041 | 7267 | 2c20 | 4e2c | 2047 | 6f61 | 6c29 | 2e0a | 0a0a | 0a25 | 2020 | 206d | 7573 | 745f | 6265 | 2854 | 7970 | 652c | 2054 |
| 2644100 | 6572 | 6d2c | 2041 | 7267 | 4e6f | 2c20 | 476f | 616c | 290a | 2520 | 2020 | 6368 | 6563 | 6b73 | 2077 | 6865 | 7468 | 6572 | 2074 | 6865 | 2054 | 6572 | 6d20 | 6265 |
| 2644160 | 6c6f | 6e67 | 7320 | 746f | 2074 | 6865 | 2069 | 6e64 | 6963 | 6174 | 6564 | 2054 | 7970 | 6520 | 2879 | 6f75 | 2077 | 696c | 6c20 | 6f66 | 7465 | 6e0a | 2520 | 2020 |
| 2644240 | 6361 | 6c6c | 206d | 7573 | 745f | 6265 | 2f32 | 2077 | 6865 | 6e20 | 796f | 7520 | 6b6e | 6f77 | 2074 | 6861 | 7420 | 7468 | 6973 | 2074 | 6573 | 7420 | 7769 | 6c6c |
| 2644320 | 2066 | 6169 | 6c2c | 2062 | 7574 | 2079 | 6f75 | 2063 | 616e | 0a25 | 2020 | 206c | 6561 | 7665 | 2069 | 7420 | 746f | 206d | 7573 | 745f | 6265 | 2f34 | 2074 | 6f20 |
| 2644400 | 6368 | 6563 | 6b20 | 666f | 7220 | 796f | 7529 | 2e20 | 2049 | 6620 | 6974 | 2069 | 736e | 2774 | 2c20 | 7468 | 6572 | 6520 | 6172 | 6520 | 7477 | 6f0a | 2520 | 2020 |
| 2644460 | 6361 | 7365 | 733a | 2020 | 7468 | 6520 | 5465 | 726d | 206d | 6179 | 206e | 6f74 | 2062 | 6520 | 696e | 7374 | 616e | 7469 | 6174 | 6564 | 2065 | 6e6f | 7567 | 6820 |
| 2644540 | 746f | 2074 | 656c | 6c20 | 7965 | 742c | 2069 | 6e20 | 7768 | 6963 | 680a | 2520 | 2020 | 6361 | 7365 | 2061 | 6e20 | 494e | 5354 | 414e | 5449 | 4154 | 494f | 4e20 |
| 2644620 | 4641 | 554c | 5420 | 7769 | 6c6c | 2062 | 6520 | 7265 | 706f | 7274 | 6564 | 2c20 | 6f72 | 2074 | 6865 | 2054 | 6572 | 6d20 | 6d61 | 7920 | 6265 | 0a25 | 2020 | 2064 |
| 2644700 | 6566 | 696e | 6974 | 656c | 7920 | 6e6f | 7420 | 6f66 | 2074 | 6865 | 2074 | 7970 | 652c | 2069 | 6e20 | 7768 | 6963 | 6820 | 6361 | 7365 | 2061 | 2054 | 5950 | 4520 |
| 2644760 | 4552 | 524f | 5220 | 6973 | 2072 | 6570 | 6f72 | 7465 | 642e | 0a25 | 2020 | 2059 | 6f75 | 2073 | 686f | 756c | 6420 | 7573 | 6520 | 7468 | 6973 | 2069 | 6e20 | 636f |
| 2645040 | 6d6d | 616e | 6473 | 2077 | 6974 | 6820 | 7369 | 6465 | 2065 | 6666 | 6563 | 7473 | 2c20 | 616e | 6420 | 7368 | 6f75 | 6c64 | 2061 | 7272 | 616e | 6765 | 0a25 | 2020 |
| 2645120 | 2074 | 6861 | 7420 | 6966 | 2074 | 6869 | 7320 | 7072 | 6564 | 6963 | 6174 | 6520 | 646f | 6573 | 206e | 6f74 | 2073 | 7563 | 6365 | 6564 | 2074 | 6865 | 2073 | 6964 |
| 2645200 | 6520 | 6566 | 6665 | 6374 | 2873 | 2920 | 7769 | 6c6c | 206e | 6f74 | 0a25 | 2020 | 2074 | 616b | 6520 | 706c | 6163 | 652e | 0a0a | 6d75 | 7374 | 5f62 | 6528 | 5479 |
| 2645260 | 7065 | 2c20 | 5465 | 726d | 2c20 | 4172 | 674e | 6f2c | 2047 | 6f61 | 6c29 | 203a | 2d0a | 0974 | 7970 | 655f | 6368 | 6563 | 6b28 | 5479 | 7065 | 2c20 | 5465 | 726d |

| | | | | | | | | | | | | | | | | | | | | | | | | |
|---|---|---|---|---|---|---|---|---|---|---|---|---|---|---|---|---|---|---|---|---|---|---|---|---|
| 2645340 | 2c20 | 4172 | 001e | 2240 | 2823 | 2938 | 392f | 3131 | 2f30 | 3220 | 6265 | 7477 | 6565 | 6e2e | 706c | 0932 | 372e | 3122 | 0000 | 0007 | 0011 | 5fac | 0100 | 2def |
| 2645420 | 0000 | 1e37 | 0000 | 0004 | 0013 | 33f4 | 0013 | 33f4 | 0001 | 006d | 0000 | 0000 | 0000 | 0028 | 0010 | a720 | b27c | b66c | 0000 | 0cb6 | 7fff | ffff | 0014 | 7d1c |
| 2645500 | 0200 | 0db5 | 0100 | 32b5 | 0000 | 1e37 | 0000 | 315f | 2c78 | 0012 | 0002 | 438a | 4e1c | 0000 | 0000 | 6a77 | 228c | f5a0 | 2cac | 0df7 | 0002 | 438a | 2ca0 | 33e5 |
| 2645560 | 0000 | 0000 | 0000 | 0001 | 0013 | 33e0 | 0013 | 33e0 | 0002 | 438a | 0010 | a590 | 0011 | 399c | 0300 | 6a57 | 0000 | 1e37 | 0000 | 000c | 0011 | 47ec | 0013 | 3438 |
| 2645640 | 0001 | 006d | 0000 | 0000 | 2954 | 0018 | 0002 | 438a | a858 | aaf0 | 0001 | ac08 | 239c | 0000 | 0013 | 3428 | 0013 | 130c | 0200 | 6a47 | 0000 | 1e37 | 0000 | 0008 |
| 2645720 | 0011 | 3538 | 0013 | 3470 | 0001 | 006d | 0000 | 0000 | 2954 | 0018 | 0002 | 438a | a858 | aaf0 | 0001 | ac08 | 239c | 0000 | 0013 | 3460 | 0013 | 12ec | 0200 | 6a3f |
| 2646000 | 0000 | 1e37 | 0000 | 0008 | 000d | 4b1c | 0012 | b254 | 0001 | 006d | 0000 | 0000 | 0011 | 3ae4 | 0100 | 6a7f | 0000 | 1e37 | 0300 | 0004 | 0013 | 34dc | 0013 | 3500 |
| 2646060 | 0001 | 006d | 0000 | 0000 | 2938 | 0012 | 000d | 4b34 | 4e1c | 0000 | 0000 | 000b | 2edc | 117c | 27f0 | 1180 | 000d | 4b34 | 2ca0 | 05ad | 0000 | 0000 | 0000 | 0001 |
| 2646140 | 0013 | 34c8 | 000d | 4b34 | 0002 | 438a | 0010 | a828 | 2954 | 0018 | 0002 | 438a | a858 | aaf0 | ffff | ac08 | 239c | 0000 | 0013 | 34b8 | 27f0 | 0018 | 0012 | b364 |
| 2646220 | 92a8 | 9a90 | 9294 | 9a90 | 3050 | 22bc | 0013 | 3540 | 0011 | 3a24 | 0300 | 6a67 | 0000 | 1e37 | 0000 | 000c | 0012 | b5b8 | 0012 | b5b8 | 0001 | 006d | 0000 | 0000 |
| 2646300 | 0011 | 39f0 | 0400 | 6a5f | 0000 | 1e37 | 0000 | 0010 | 0013 | 35a4 | 0013 | 35a4 | 0001 | 006d | 0000 | 0000 | 0013 | 3550 | 0300 | 6a5f | 0000 | 1e37 | 0000 | 000c |
| 2646360 | 0013 | 35fc | 0013 | 35fc | 0001 | 006d | 0000 | 0000 | 27f0 | 0014 | 0012 | a3c4 | 4e1c | 0000 | 0000 | 0ad7 | 3050 | c5a8 | 2cac | 3558 | 0002 | 438a | 2ca0 | 23ff |
| 2646440 | 0000 | 0000 | 0000 | 0001 | 0013 | 3590 | 0013 | 35c8 | 000d | 4b4c | 0010 | d524 | 2954 | 0020 | 0002 | 438a | 56f8 | 5fa0 | 671c | bfcc | a874 | aaf0 | 0001 | ac4c |
| 2646520 | 239c | 0000 | 0013 | 3560 | 27f0 | 0014 | 0013 | 3620 | 4e1c | 0000 | 0000 | 0ad7 | 3050 | c5a8 | 2cac | 3602 | 0002 | 438a | 2ca0 | 360a | 0000 | 0004 | 0000 | 0002 |
| 2646600 | 0013 | 35e8 | 0013 | 3634 | 0013 | 363e | 000b | 1e5c | 28c4 | 0014 | 0013 | 3634 | 4e1c | 0000 | 0000 | 0007 | 4960 | 228c | 2954 | 0020 | 0002 | 438a | 56f8 | 5fa0 |
| 2646660 | 671c | bfcc | a874 | aaf0 | 0001 | ac4c | 239c | 0000 | 0013 | 3580 | 0011 | 3a6c | 0300 | 6a6f | 0000 | 1e37 | 0000 | 000c | 0013 | 3674 | 0013 | 368c | 0001 | 006d |
| 2646740 | 0000 | 0000 | 27f0 | 0016 | 0013 | 368c | 48f8 | 35ec | 3050 | 5758 | 6b48 | 5370 | 7220 | 08ad | 2954 | 0020 | 0002 | 438a | 57b8 | 6b48 | 6784 | bfcc | a858 | aaf0 |
| 2647020 | 0001 | ac08 | 239c | 0000 | 0013 | 3664 | 0013 | 12cc | 0300 | 1e37 | 0000 | 3287 | 0000 | 000c | 0012 | c338 | 0012 | c338 | 0041 | 0000 | 0000 | 0000 | 0013 | 3488 |
| 2647100 | 0100 | 6a3f | 0000 | 3287 | 0000 | 0004 | 0011 | 3618 | 0011 | 3618 | 0041 | 0000 | 0000 | 0000 | 0013 | 3450 | 0100 | 6a47 | 0000 | 3287 | 0000 | 0004 | 0011 | 3470 |
| 2647160 | 0011 | 3470 | 0041 | 0000 | 0000 | 0000 | 0013 | 132c | 0300 | 6a4f | 0000 | 3287 | 0000 | 000c | 0011 | 33e0 | 0011 | 33e0 | 0041 | 0000 | 0000 | 0000 | 0013 | 134c |
| 2647240 | 0100 | 2d4f | 0000 | 3287 | 0000 | 0004 | 0011 | 32d8 | 0011 | 32d8 | 0041 | 0000 | 0000 | 0000 | 001a | 6f70 | 6572 | 6174 | 6f72 | 735f | 696e | 5f61 | 7361 | 705f |
| 2647320 | 7363 | 6865 | 6475 | 6c65 | 0000 | 15ad | 0011 | 3bd0 | 0200 | 6a8f | 0000 | 3287 | 0000 | 0008 | 0013 | 378c | 0013 | 378c | 0001 | 006c | 0000 | 0000 | 2cac | 3775 |
| 2647400 | 0002 | 438a | 2ca0 | 3748 | 0000 | 0000 | 0000 | 0001 | 0012 | a888 | 0012 | f354 | 0012 | f35e | 0010 | e14c | 0015 | 6f70 | 6572 | 6174 | 6f72 | 735f | 696e | 5f73 |
| 2647460 | 6368 | 6564 | 756c | 6500 | 0011 | 3c14 | 0300 | 6a97 | 0000 | 3287 | 0000 | 000c | 0013 | 37e8 | 0013 | 37e8 | 0001 | 006c | 0000 | 0000 | 2c78 | 0014 | 0002 | 438a |
| 2647540 | 36b8 | 3640 | 320c | 22bc | 0013 | 380c | 0013 | 37c8 | 0400 | 6a97 | 0000 | 3287 | 0000 | 0010 | 0012 | f40c | 0012 | f40c | 0001 | 006c | 0000 | 0000 | 000e | 49e0 |
| 2647620 | 0400 | 6a9f | 0000 | 3287 | 0000 | 0010 | 0013 | 3850 | 0013 | 3850 | 0001 | 006c | 0000 | 0000 | 27f0 | 0014 | 0012 | f470 | 4e1c | 0000 | 0000 | 0007 | 5548 | 2edc |
| 2647700 | 2cac | 3830 | 0002 | 438a | 2ca0 | 0ad7 | 0000 | 0000 | 0000 | 0001 | 0013 | 383c | 0012 | f470 | 0012 | f47a | 0010 | e19c | 0000 | 002c | 0013 | 5884 | b27c | b66c |
| 2647760 | 0000 | 0d1f | 7fff | ffff | 0012 | cd78 | 0200 | 0db5 | 0200 | 2f35 | 0000 | 6adf | 0000 | 037b | 0000 | 315f | 0000 | 002c | 0013 | 58b0 | b27c | b66c | 0000 | 0d3f |
| 2650040 | 7fff | ffff | 0012 | cda4 | 0200 | 0db5 | 0200 | 224d | 0000 | 6adf | 0000 | 3287 | 0000 | 315f | 000f | 6675 | 6e63 | 7469 | 6f6e | 616c | 5f63 | 6f73 | 7400 | 0000 |
| 2650120 | 0013 | 3a20 | 0000 | 0100 | b27c | b66c | 0000 | 0d21 | 0000 | 013e | 000a | d16d | 0200 | 0db5 | 0200 | 270d | 0000 | 6adf | 0000 | 3287 | 0000 | 315f | 0013 | 3948 |
| 2650200 | 0000 | 0038 | b27c | b66c | 0000 | 0d22 | 0000 | 0d40 | 0013 | 3978 | 0200 | 0db5 | 0500 | 1cdd | 0000 | 6b37 | 0000 | 000b | 0000 | 3287 | 009b | d503 | 0000 | 037b |
| 2650260 | 0000 | 315f | 0013 | 3974 | 0000 | 002c | b4f0 | b4e4 | 0000 | 0121 | 7fff | ffff | 0008 | b0dd | 0000 | 0000 | 0000 | 0000 | 0013 | 44dc | 0002 | 438a | 000b | 4ed8 |
| 2650340 | 0013 | 39ac | 0000 | 0038 | b27c | b66c | 0000 | 0d23 | 0000 | 0d41 | 0013 | 39b0 | 0200 | 0db5 | 0500 | 1cdd | 0000 | 5eef | 0000 | 000b | 0000 | 3287 | 009b | e143 |
| 2650420 | 0000 | 037b | 0000 | 315f | 0013 | 3a20 | 0000 | 0038 | b27c | b66c | 0000 | 0d24 | 0000 | 0d42 | 0013 | 3a24 | 0200 | 0db5 | 0500 | 1cdd | 0000 | 6b3f | 0000 | 0013 |
| 2650500 | 0000 | 3287 | 009b | e403 | 0000 | 037b | 0000 | 315f | 2c78 | 003c | 0002 | 438a | 45b8 | 4714 | 37dc | 32f0 | 001c | 247c | 000b | 3c08 | 0020 | 3348 | 40b4 | 001c |
| 2650560 | 0012 | 36d4 | 001c | 33bc | 3818 | 408c | 0013 | 78c8 | 0014 | 3d30 | 2420 | 0000 | 0013 | 7ca0 | 0013 | 3aa8 | 0000 | 0038 | b27c | b66c | 0000 | 0d25 | 0000 | 0d43 |
| 2650640 | 0013 | 3aac | 0200 | 0db5 | 0500 | 1cdd | 0000 | 6b47 | 0000 | 0013 | 0000 | 3287 | 009b | e503 | 0000 | 037b | 0000 | 315f | 2954 | 0050 | 0002 | 438a | 5758 | 6854 |
| 2650720 | 69b0 | 3804 | 31f0 | 247c | 0013 | 7cec | 0018 | 332c | 3bf4 | 0000 | 0013 | 7d0c | 0014 | 37f0 | 31f0 | 247c | 0013 | 7d2c | 0014 | 4550 | 6d50 | 5370 | 4300 | 0000 |
| 2651000 | 0000 | 6b67 | 0008 | c3fc | 0010 | 37dc | 31f0 | 234c | 0013 | 7ca0 | 0013 | 3b0c | 0000 | 0038 | b27c | b66c | 0000 | 0126 | 0000 | 0d44 | 0013 | 3b10 | 0200 | 0db5 |
| 2651060 | 0500 | 1cdd | 0000 | 6b4f | 0000 | 0013 | 0000 | 3287 | 009b | e763 | 0000 | 037b | 0000 | 315f | 2c78 | 002c | 0002 | 438a | 2520 | 46d8 | 2ba0 | 0010 | 000c | 39a4 |
| 2651140 | 0013 | 7d80 | 0010 | 2eb0 | 2c58 | 43c0 | 0100 | 6b37 | 6d0c | 234c | 0012 | 0c40 | 0013 | 3b70 | 0000 | 0038 | b27c | b66c | 0000 | 0d27 | 0000 | 0d45 | 0013 | 3b74 |
| 2651220 | 0200 | 0db5 | 0500 | 1cdd | 0000 | 6b5f | 0000 | 0013 | 0000 | 3297 | 009b | e963 | 0000 | 037b | 0000 | 315f | 2c78 | 002c | 0002 | 438a | 2520 | 46d8 | 2ba0 | 0010 |
| 2651300 | 000c | 39a4 | 0013 | 7da0 | 0010 | 2eb0 | 2c58 | 43c0 | 0100 | 5eef | 6d0c | 234c | 0012 | 0c40 | 0013 | 3c58 | 0000 | 00e0 | b27c | b66c | 0000 | 0d28 | 0000 | 0d46 |
| 2651360 | 0013 | 3bac | 0200 | 0db5 | 0500 | 1cdd | 0000 | 6b77 | 0000 | 000b | 0000 | 3287 | 009b | ed03 | 0000 | 037b | 0000 | 315f | 0013 | 3be0 | 0000 | 0038 | b27c | b66c |
| 2651440 | 0000 | 0d29 | 0000 | 0d47 | 0013 | 3be4 | 0200 | 0db5 | 0500 | 1cdd | 0000 | 6b6f | 0000 | 000b | 0000 | 3287 | 009b | ec03 | 0000 | 037b | 0000 | 315f | 0013 | 3c18 |
| 2651520 | 0000 | 0038 | b27c | b66c | 0000 | 0d2a | 0000 | 0d48 | 0013 | 3c5c | 0200 | 0db5 | 0500 | 1cdd | 0000 | 6b7f | 0000 | 001b | 0000 | 3287 | 009b | ef83 | 0000 | 037b |
| 2651600 | 0000 | 315f | 0013 | 3c58 | 0000 | 0038 | b27c | b66c | 0000 | 0d35 | 0000 | 0d53 | 0013 | 40a8 | 0200 | 0db5 | 0500 | 1cdd | 0000 | 6bcf | 0000 | 0013 | 0000 | 3287 |
| 2651660 | 009c | 0643 | 0000 | 037b | 0000 | 315f | 0011 | 3198 | 0000 | 0000 | 0013 | 3ccc | 0000 | 0038 | b27c | b66c | 0000 | 0d2b | 0000 | 0d49 | 0013 | 3cd0 | 0200 | 0db5 |
| 2651740 | 0500 | 1cdd | 0000 | 6b87 | 0000 | 000b | 0000 | 3287 | 009b | eb03 | 0000 | 037b | 0000 | 315f | 2c78 | 003c | 0002 | 438a | 45b8 | 33bc | 44e8 | 0000 | 0200 | 65cf |
| 2652020 | 5fa0 | 671c | 44a0 | 0000 | 0200 | 0daf | 4b8c | 0000 | 0000 | 3287 | 6c34 | 247c | 0008 | c03c | 0014 | 3d30 | 2420 | 0000 | 0013 | 7e2c | 0013 | 3d6c | 0000 | 0070 |
| 2652100 | b27c | b66c | 0000 | 012c | 0000 | 0d4a | 0013 | 3d08 | 0200 | 0db5 | 0500 | 1cdd | 0000 | 6b87 | 0000 | 0013 | 0000 | 3287 | 009b | f163 | 0000 | 037b | 0000 | 315f |
| 2652160 | 0013 | 3d6c | 0000 | 0038 | b27c | b66c | 0000 | 0d2d | 0000 | 0d4b | 0013 | 3d70 | 0200 | 0db5 | 0500 | 1cdd | 0000 | 6b8f | 0000 | 0013 | 0000 | 3287 | 009b | f363 |
| 2652240 | 0000 | 037b | 0000 | 315f | 2954 | 0030 | 0002 | 438a | 45b8 | 5758 | 671c | 6a00 | 5d10 | 0000 | 0200 | 0ad7 | 61e8 | 3244 | 3b4c | 0000 | 0013 | 7e8c | 0014 | 2ecc |
| 2652320 | 2410 | 0600 | 0013 | 7e6c | 0013 | 3dd4 | 0000 | 0038 | b27c | b66c | 0000 | 0d2e | 0000 | 0d4c | 0013 | 3dd8 | 0200 | 0db5 | 0500 | 1cdd | 0000 | 6b97 | 0000 | 0023 |
| 2652400 | 0000 | 3287 | 009b | f463 | 0000 | 037b | 0000 | 315f | 2c78 | 0030 | 0002 | 438a | 2520 | 46d8 | 4754 | 47d0 | 2ba0 | 0018 | 0018 | 38d4 | 3858 | 37dc | 24d0 | 0000 |

| | | | | | | | | | | | | | | | | | | | | | | | | |
|---|---|---|---|---|---|---|---|---|---|---|---|---|---|---|---|---|---|---|---|---|---|---|---|---|
| 2652460 | 0013 | 7ed4 | 0018 | 231c | 0013 | 7ef4 | 2c58 | 22a0 | 0013 | 3e6c | 0000 | 0038 | b27c | b66c | 0000 | 0d2f | 0000 | 0d4d | 0013 | 3e70 | 0200 | 0db5 | 0500 | 1cdd |
| 2652540 | 0000 | 6b9f | 0000 | 0023 | 0000 | 3287 | 009b | f6a3 | 0000 | 037b | 0000 | 315f | 2938 | 0030 | 0013 | 3e38 | 4e1c | 0000 | 0000 | 6baf | 3574 | 35ec | 373c | 0018 |
| 2652620 | 3050 | 4210 | 0000 | 000b | 4268 | 0000 | 000c | 000b | 239c | 0000 | 0013 | 7f14 | 28c4 | 0030 | 0011 | 3e30 | 4e1c | 0000 | 000c | 6bb7 | 3574 | 35ec | 373c | 0018 |
| 2652700 | 3050 | 4210 | 0000 | 000b | 4268 | 0000 | 0000 | 000b | 239c | 0000 | 0013 | 7f58 | 0013 | 3ef4 | 0000 | 0038 | b27c | b66c | 0000 | 0130 | 000c | 0d4e | 0013 | 3ef8 |
| 2652760 | 0200 | 0db5 | 0500 | 1cdd | 0000 | 6ba7 | 0000 | 001b | 0000 | 3287 | 009b | f7a3 | 0000 | 037b | 0000 | 315f | 2c78 | 0050 | 0002 | 438a | 45d0 | 46ec | 4740 | 2ba0 |
| 2653040 | 0018 | 002a | 2ba0 | 0018 | 0012 | 3844 | 37f0 | 3a4c | 0013 | 7f8c | 0018 | 2c88 | 0012 | 2c58 | 3844 | 3804 | 3ba0 | 0000 | 0013 | 7f8c | 0018 | 2eb0 | 2c58 | 43c0 |
| 2653120 | 0300 | 6b7f | 6d94 | 6d50 | 6d0c | 234c | 0012 | 0c40 | 0013 | 3fec | 0000 | 00a8 | b27c | b66c | 0000 | 0d31 | 0000 | 0d4f | 0013 | 3f30 | 0200 | 0db5 | 0500 | 1cdd |
| 2653200 | 0000 | 6bbf | 0000 | 001b | 0000 | 3287 | 009b | fc63 | 0000 | 037b | 0000 | 315f | 0013 | 3f64 | 0000 | 0038 | b27c | b66c | 0000 | 0d32 | 0000 | 0d50 | 0013 | 3f68 |
| 2653260 | 0200 | 0db5 | 0500 | 1cdd | 0000 | 6bc7 | 0000 | 0013 | 0000 | 3287 | c09b | ff43 | 0000 | 037b | 0000 | 315f | 0013 | 3fec | 0000 | 0038 | b27c | b66c | 0000 | 0d33 |
| 2653340 | 0000 | 0d51 | 0013 | 3ff0 | 0200 | 0db5 | 0500 | 1cdd | 0000 | 6bc7 | 0000 | 001b | 0000 | 3287 | 009c | 0183 | 0000 | 037b | 0000 | 315f | 2c78 | 0050 | 0002 | 438a |
| 2653420 | 2520 | 46d8 | 35ec | 247c | 0013 | 7c80 | 0010 | 3844 | 4450 | 0018 | 0100 | 6b37 | 671c | 43e4 | 0200 | 6b57 | 6b74 | 671c | 44e8 | 0000 | 0200 | 0abf | 6c94 | 0018 |
| 2653500 | 6bb4 | 43e4 | 0200 | 04af | 4b8c | 0000 | 0000 | 3287 | 6c34 | 234c | 0008 | c03c | 0013 | 4164 | 0000 | 00f0 | b27c | b66c | 0000 | 0d34 | 0000 | 0d52 | 0013 | 3c1c |
| 2653560 | 0200 | 0db5 | 0500 | 1cdd | 0000 | 6b57 | 0000 | 0013 | 0000 | 3287 | c09b | e863 | 0000 | 037b | 0000 | 315f | 0013 | 40a4 | 0000 | 0080 | 0000 | 0000 | 0000 | 0000 |
| 2653640 | 0000 | 0000 | 0000 | 0000 | 0000 | 0000 | 0000 | 0000 | 0000 | 0000 | 0000 | 0000 | 0011 | 4af4 | 0000 | 0000 | 0000 | 0000 | 0000 | 0000 | 0000 | 0000 | 0012 | c8ac |
| 2653720 | 0012 | c900 | 0012 | c954 | 0012 | cac4 | 0012 | c9ac | 0011 | 416c | 0000 | 0000 | 0000 | 0000 | 0011 | 41f8 | 0011 | 44d4 | 0011 | 4c38 | 0011 | 4fb0 | 0011 | 3198 |
| 2654000 | 000b | 563c | 0011 | 2fd0 | 0011 | 2f18 | 0011 | 2ef4 | 0013 | 4164 | 0000 | 0038 | b27c | b66c | 0000 | 0d36 | 0000 | 0d54 | 0013 | 4168 | 0200 | 0db5 | 0500 | 1cdd |
| 2654060 | 0000 | 6bd7 | 0000 | 001b | 0000 | 3287 | 009c | 0bc3 | 0000 | 037b | 0000 | 315f | 2c78 | 0088 | 0002 | 438a | 45e8 | 0020 | 4714 | 4768 | 2e7c | ae74 | 0024 | 2ba0 |
| 2654140 | 0028 | 0020 | 3af4 | 0020 | 000d | 7d48 | 0028 | aa88 | 0024 | 2e98 | 37c4 | 0020 | 3174 | 4a7c | 000c | 2c88 | 0010 | 2c58 | 3280 | 56f8 | 6e1c | 0020 | 5370 | bfcc |
| 2654220 | 2e7c | ae74 | 001c | 2ba0 | 0020 | 001e | 3c48 | 0000 | 000d | 7d48 | 0020 | aa88 | c01c | 2e98 | 37b0 | 318c | 4a7c | 0010 | 2c88 | 000e | 2c58 | 329c | 56f8 | 6dd8 |
| 2654300 | 5370 | bfcc | 386c | 3d30 | 3cf4 | 234c | 0013 | 8198 | 0013 | 4224 | 0000 | 0038 | b27c | b66c | 0000 | 0d37 | 0000 | 0d55 | 0013 | 4228 | 0200 | 0db5 | 0500 | 1cdd |
| 2654360 | 0000 | 6bdf | 0000 | 001b | 0000 | 3287 | 009c | 0cc3 | 0000 | 037b | 0000 | 315f | 2c78 | 0088 | 0002 | 438a | 45e8 | 0030 | 4728 | 0024 | 4754 | 3380 | 0028 | 3c9c |
| 2654440 | 0000 | 0030 | 000b | 5408 | 0034 | 3380 | 002c | 3c9c | 0000 | 0030 | 000b | 5ef0 | 0030 | 33d8 | 3e70 | 002c | 40b4 | 0028 | 000c | 4118 | 0028 | 3380 | 001c | 3c9c |
| 2654520 | 0000 | 0024 | 000b | 5408 | 0028 | 3380 | 0020 | 3c9c | 0000 | 0024 | 000b | 5ef0 | 0024 | 33f4 | 3e70 | 0020 | 40b4 | 001c | 000c | 4118 | 001c | 33a0 | 3d48 | 408c |
| 2654600 | 000d | d544 | 0014 | 37f0 | 3cf4 | 234c | 0008 | c83c | 0013 | 4328 | 0000 | 0070 | b27c | b56c | 0000 | 0d38 | 0000 | 0d56 | 0013 | 4260 | 0200 | 0db5 | 0500 | 1cdd |
| 2654660 | 0000 | 6be7 | 0000 | 001b | 0000 | 3287 | 009c | 0e63 | 0000 | 037b | 0000 | 315f | 0013 | 4328 | 0000 | 0038 | b27c | b66c | 0000 | 0d39 | 0000 | 0d57 | 0013 | 432c |
| 2654740 | 0200 | 0db5 | 0500 | 1cdd | 0000 | 6be7 | 0000 | 0023 | 0000 | 3287 | 009c | 1083 | 0000 | 037b | 0000 | 315f | 2c78 | 0094 | 0002 | 438a | 45e8 | 0024 | 4728 | 001c |
| 2655020 | 4768 | 47e4 | 2e7c | ae74 | 0028 | 2ba0 | 002c | 0020 | 3af4 | 0024 | 000d | 7d48 | 002c | aa88 | 0028 | 2e98 | 37c4 | 0024 | 3174 | 4a7c | 000c | 2c88 | 0010 | 2c58 |
| 2655100 | 3280 | 56f8 | 6e1c | 0024 | 5370 | bfcc | 2e7c | ae74 | 0020 | 2ba0 | 0024 | 0020 | 3af4 | 001c | 000d | 7d48 | 0024 | aa88 | 0020 | 2e98 | 37c4 | 001c | 318c | 4a7c |
| 2655160 | 0010 | 2c88 | 0010 | 2c58 | 329c | 56f8 | 6e1c | 001c | 5370 | bfcc | 38e8 | 386c | 3130 | 3cf4 | 242c | 0000 | 0013 | 8248 | 0013 | 4400 | 0000 | 0038 | b27c | b66c |
| 2655240 | 0000 | 0d3a | 0000 | 0d58 | 0013 | 4404 | 0200 | 0db5 | 0500 | 1cdd | 0000 | 6bef | 0000 | 0023 | 0000 | 3287 | 009c | 1243 | 0000 | 037b | 0000 | 315f | 2c78 | 00a0 |
| 2655320 | 0002 | 438a | 45e8 | 0038 | 4728 | 0034 | 477c | 47a8 | 3380 | 0030 | 3af4 | 0038 | 000b | 52cc | 003c | 3380 | 002c | 3c9c | 0000 | 0038 | 000b | 5d3c | 0038 | 3380 |
| 2655400 | 0028 | 3c9c | 0000 | 0034 | 000b | 52cc | 0038 | 3380 | 0024 | 3c9c | 0000 | 0034 | 000b | 5d3c | 0034 | 3380 | 0020 | 411c | 0000 | 0030 | 0008 | c83c | 0030 | 3380 |
| 2655460 | 001c | 411c | 0000 | 002c | 0008 | c83c | 002c | 3348 | 40b4 | 0028 | 0008 | c83c | 0028 | 332c | 40b4 | 0024 | 0008 | c83c | 0024 | aa88 | 0020 | aa88 | 001c | 9d88 |
| 2655540 | af70 | aa50 | aa34 | 9d88 | af34 | 723c | 0013 | 4448 | 0000 | 0038 | b27c | b66c | 0000 | 0d3b | 0000 | 0d59 | 0013 | 44dc | 0200 | 0db5 | 0500 | 1cdd | 0000 | 6bf7 |
| 2655620 | 0000 | 002b | 0000 | 3287 | 009c | 1563 | 0000 | 037b | 0000 | 315f | 2c78 | 00a0 | 0002 | 438a | 45e8 | 0028 | 4728 | 0020 | 4768 | 47e4 | 4880 | 0018 | 001c | 2e7c |
| 2655700 | ae74 | 002c | 2ba0 | 0030 | 0022 | 3c9c | 0000 | 0028 | 000d | 7d48 | 0030 | aa88 | 002c | 2e98 | 37c4 | 0028 | 3174 | 4a7c | 000c | 2c88 | 0010 | 2c58 | 3280 | 56f8 |
| 2655760 | 6e1c | 0028 | 5370 | bfcc | 2e7c | ae74 | 0024 | 2ba0 | 0028 | 0020 | 3af4 | 0020 | 000d | 7d48 | 0028 | aa88 | 0024 | 2e98 | 37c4 | 0020 | 318c | 4a7c | 0010 | 2c88 |
| 2656040 | 0010 | 2c58 | 329c | 56f8 | 6e1c | 0020 | 5370 | bfcc | 3984 | 0018 | 001c | 38e8 | 386c | 3d30 | 3cf4 | 234c | 0013 | 82cc | 0013 | 45c4 | 0000 | 0038 | b130 | b66c |
| 2656120 | 0000 | 0d3c | 0000 | 0d5a | 0013 | 394d | 0200 | 0db5 | 0500 | 1cdd | 0000 | 6bff | 0000 | 002b | 0000 | 3287 | 009c | 1663 | 0000 | 037b | 0000 | 315f | 2c78 | 00b4 |
| 2656200 | 0002 | 438a | 45e8 | 0038 | 4728 | 002c | 4790 | 0020 | 47e4 | 482c | 0018 | 3380 | 0030 | 3c9c | 0000 | 0038 | 000b | 5408 | 003c | 3380 | 0034 | 3c9c | 0000 | 0038 |
| 2656260 | 000b | 5ef0 | 0038 | 3410 | 001c | 3e70 | 0034 | 411c | 0000 | 0030 | 000c | 4118 | 0030 | 3380 | 0024 | 3c9c | 0000 | 002c | 000b | 5408 | 0030 | 3380 | 0028 | 3c9c |
| 2656340 | 0000 | 002c | 000b | 5ef0 | 002c | 33d8 | 3e70 | 0028 | 40b4 | 0024 | 000c | 4118 | 0024 | 33a0 | 3804 | 3c9c | 0000 | 001c | 000d | d544 | 0024 | 382c | 0020 | 411c |
| 2656420 | 0000 | 001c | 0008 | c83c | 001c | 3818 | 40f4 | 0000 | 0008 | c83c | 0014 | 37f0 | 3cf4 | 234c | 0008 | c83c | 0013 | 58ec | 0000 | 12bc | 0000 | 0000 | 0000 | 0000 |
| 2656500 | 0000 | 0000 | 0000 | 0000 | 0000 | 0000 | 0000 | 0000 | 0000 | 0000 | 0011 | 4c38 | 000a | 3021 | 0011 | 3198 | 000b | 563c | 0011 | 2fd0 | 0011 | 2f18 | 0011 | 2ef4 |
| 2656560 | 0013 | 59ec | 0000 | 127c | 0a0a | 636f | 7374 | 285f | 2c20 | 4e6f | 6465 | 2c20 | 4e6f | 6465 | 2c20 | 3029 | 203a | 2d20 | 212e | 0a63 | 6f73 | 7428 | 436f | 7374 |
| 2656640 | 2c20 | 4672 | 6f6d | 2c20 | 546f | 2c20 | 4469 | 7374 | 2920 | 3a2d | 0a09 | 6361 | 6c6c | 2843 | 6f73 | 742c | 2046 | 726f | 6d2c | 2054 | 6f2c | 2044 | 6973 | 7429 |
| 2656720 | 2c0a | 0921 | 2e0a | 636f | 7374 | 2843 | 6f73 | 742c | 2046 | 726f | 6d2c | 2054 | 6f2c | 2044 | 6973 | 7429 | 203a | 2d0a | 0963 | 616c | 6c28 | 436f | 7374 | 2c20 |
| 2657000 | 546f | 2c20 | 4672 | 6f6d | 2c20 | 4469 | 7374 | 292c | 0a09 | 212e | 0a63 | 6f73 | 7428 | 5f2c | 205f | 2c20 | 5f2c | 2069 | 6e66 | 696e | 6974 | 7929 | 2e0a | 0a25 |
| 2657060 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 2657140 | 2525 | 2525 | 2525 | 2525 | 2525 | 2525 | 2525 | 2525 | 2525 | 2525 | 2525 | 2525 | 2525 | 2525 | 250a | 2525 | 2525 | 2073 | 656c | 665f | 6475 | 7028 | 4e6f | 6465 |
| 2657220 | 732c | 2047 | 7261 | 7068 | 290a | 2525 | 2525 | 2047 | 7261 | 7068 | 2069 | 7320 | 6120 | 6c69 | 7374 | 206f | 6620 | 4e6f | 6465 | 2d4e | 6f64 | 6520 | 7061 | 6972 |
| 2657300 | 7320 | 6f66 | 2061 | 6c6c | 2074 | 6865 | 204e | 6f64 | 6573 | 2e20 | 5573 | 6564 | 2066 | 6f72 | 0a25 | 2525 | 2520 | 6765 | 6e65 | 7261 | 7469 | 6e67 | 2077 | 6561 |
| 2657360 | 6b20 | 636c | 7573 | 7465 | 7273 | 206f | 6620 | 6e6f | 6465 | 732e | 0a0a | 7365 | 6c66 | 5f64 | 7570 | 285b | 5d2c | 205b | 5d29 | 2e0a | 7365 | 6c66 | 5f64 | 7570 |
| 2657440 | 285b | 4e6f | 6465 | 7c4e | 6f64 | 6573 | 5d2c | 205b | 4e6f | 6465 | 2d4e | 6f64 | 657c | 5265 | 7374 | 5d29 | 203a | 2d0a | 0973 | 656c | 665f | 6475 | 7028 | 4e6f |
| 2657520 | 6465 | 732c | 2052 | 6573 | 7429 | 2e0a | 0a25 | 2525 | 2525 | 2525 | 2525 | 2525 | 2525 | 2525 | 2525 | 2525 | 2525 | 2525 | 2525 | 2525 | 2525 | 2525 | 2525 | 2525 |

```
2657600  2525 2525 2525 2525 2525 2525 2525 2525 2525 2525 2525 2525 2525 2525 2525 2525 2525 2525 2525 2525 2525 250a 0a65 6e64
2657660  5f6f 665f 6669 6c65 2e0a 0a25 2525 2525 2525 2525 2525 2525 2525 2525 2525 2525 2525 2525 2525 2525 2525 2525 2525 2525
2657740  2525 2525 2525 2525 2525 2525 2525 2525 2525 2525 2525 2525 2525 2525 2525 2525 2525 2525 2525 2525 250a 2525 2525 2054
2660020  6573 7420 636f 6465 0a0a 7465 7374 2843 2920 3a2d 0a09 636c 7573 7465 725f 7365 7473 5f66 726f 6d5f 6e6f 6465 7328 5b61
2660100  2c62 2c63 2c64 2c65 2c66 2c67 2c68 5d2c 2064 6973 7461 6e63 652c 2043 292e 0a0a 6469 7374 616e 6365 2861 2c20 622c 2031
2660160  292e 0a64 6973 7461 6e63 6528 612c 2063 2c20 312e 3431 3429 2e0a 6469 7374 616e 6365 2861 2c20 642c 2031 292e 0a64 6973
2660240  7461 6e63 6528 622c 2063 2c20 3129 2e0a 6469 7374 616e 6365 2862 2c20 642c 2031 2e34 3134 292e 0a64 6973 7461 6e63 6528
2660320  632c 2064 2c20 3129 2e0a 6469 7374 616e 6365 2865 2c66 2c31 292e 0a64 6973 7461 6e63 6528 662c 672c 3129 2e0a 6469 7374
2660400  616e 6365 2867 2c68 2c31 292e 0a25 2525 2525 2525 2525 2525 2525 2525 2525 2525 2525 2525 2525 2525 2525 2525 2525 2525
2660460  2525 2525 2525 2525 2525 2525 2525 2525 2525 2525 2525 2525 2525 2525 2525 2525 2525 2525 2525 2525 2525 250a 0000 0003
2660540  0000 000b 0013 49d1 0000 000b 0013 4a01 0100 2acf 0000 0013 0100 2a97 0000 001b 0100 2acf 0000 0013 0100 2acf 0000 001b
2660620  0200 17a7 ffff fffb 0000 0003 0200 17a7 ffff fffb 0000 0003 0000 000b 0013 4a19 0000 000b 0013 4a49 0100 2acf 0000 0013
2660700  0012 fc5d 0000 0007 0012 fc7d 0013 4a52 0012 fc9d 0013 4a5a 0012 fcc1 0013 4a62 0012 fce1 0013 4a6a 0012 fd01 0013 4a72
2660760  0012 fd21 0013 4a7a 0012 fd41 0013 4a82 0012 fd61 0013 4a8a 0012 fd81 0013 4a92 0012 fda1 0013 4a9a 0012 fdc1 0013 4aa2
2661040  0012 fde1 0013 4aaa 0012 fe01 0013 4ab2 0012 fe21 0013 4aba 0012 fe41 0013 4ac2 0012 fe61 0013 4aca 0012 fe81 0013 4ad2
2661120  0012 fea1 0013 4ada 0012 fec5 0013 4ae2 0012 fee5 0013 4aea 0012 ff05 0013 4af2 0012 ff25 0013 4afa 0012 ff45 0013 4b02
2661200  0012 ff69 0013 4b0a 0012 ff89 0013 4b12 0012 ffa9 0013 4b1a 0012 ffc9 0013 4b22 0012 ffe9 0013 4b2a 0013 0009 0013 4b32
2661260  0013 0029 0013 4b3a 0013 0049 0013 4b42 0013 0069 0013 4b4a 0013 0089 0013 4b52 0013 00a9 0013 4b5a 0013 00c9 0013 4b62
2661340  0013 00ed 0013 4b6a 0013 010d 0013 4b72 0013 012d 0013 4b7a 0013 014d 0013 4b82 0013 016d 0013 4b8a 0013 0191 0013 4b92
2661420  0013 01b1 0013 4b9a 0013 01d1 0013 4ba2 0013 01f1 0013 4baa 0013 0211 0013 4bb2 0013 0231 0013 4bba 0013 0251 0013 4bc2
2661500  0013 0271 0013 4bca 0013 0291 0013 4bd2 0013 02b1 0013 4bda 0013 02d1 0013 4be2 0013 02f1 0013 4bea 0013 0315 0013 4bf2
2661560  0013 0335 0013 4bfa 0013 0355 0013 4c02 0013 0375 0013 4c0a 0013 0395 0013 4c12 0013 03b9 0013 4c1a 0013 0339 0013 4c22
2661640  0013 03f9 0013 4c2a 0013 0419 0013 4c32 0013 0439 0013 4c3a 0013 0459 0013 4c42 0013 0479 0013 4c4a 0013 0499 0013 4c52
2661720  0013 04bd 0013 4c5a 0013 04dd 0013 4c62 0013 04fd 0013 4c6a 0013 051d 0013 4c72 0013 053d 0013 4c7a 0013 0561 0013 4c82
2662000  0013 0581 0013 4c8a 0013 05a1 0013 4c92 0013 05c1 0013 4c9a 0013 05e1 0013 4ca2 0013 0601 0013 4caa 0013 0621 0013 4cb2
2662060  0013 0641 0013 4cba 0013 0661 0013 4cc2 0013 0681 0013 4cca 0013 06a1 0013 4cd2 0013 06c5 0013 4cda 0013 06e5 0013 4ce2
2662140  0013 0705 0013 4cea 0013 0725 0013 4cf2 0013 0745 0013 4cfa 0013 0769 0013 4d02 0013 0789 0013 4d0a 0013 07a9 0013 4d12
2662220  0013 07c9 0013 4d1a 0013 07e9 0013 4d22 0013 0809 0013 4d2a 0013 0829 0013 4d32 0013 0849 0013 4d3a 0013 0869 0013 4d42
2662300  0013 088d 0013 4d4a 0013 08ad 0013 4d52 0013 08cd 0013 4d5a 0013 08ed 0013 4d62 0013 090d 0013 4d6a 0013 0931 0013 4d72
2662360  0013 0951 0013 4d7a 0013 0971 0013 4d82 0013 0991 0013 4d8a 0013 09b1 0013 4d92 0013 09d1 0013 4d9a 0013 09f5 0013 4da2
2662440  0013 0a15 0013 4daa 0013 0a35 0013 4db2 0013 0a55 0013 4dba 0013 0a75 0013 4dc2 0100 08af 0000 02bf 0200 0ad7 0013 0a61
2662520  0013 4dd1 0013 4dd9 0000 0007 0300 08af 0000 1ea7 0012 f995 0013 4959 0200 0ad7 0000 0a87 0013 4ded 0013 4dfd 0013 4de6
2662600  0013 0a35 0013 4e0a 0013 0a15 0013 4e12 0013 09f5 0013 4e1a 0013 09d1 0013 4e22 0013 09b1 0013 4e2a 0013 0991 0013 4e32
2662660  0013 0971 0013 4e3a 0013 0951 0013 4e42 0013 0931 0013 4e4a 0013 090d 0013 4e52 0013 08ed 0013 4e5a 0013 08cd 0013 4e62
2662740  0013 08ad 0013 4e6a 0013 088d 0013 4e72 0013 0869 0013 4e7a 0013 0849 0013 4e82 0013 0829 0013 4e8a 0013 0809 0013 4e92
2663020  0013 07e9 0013 4e9a 0013 07c9 0013 4ea2 0013 07a9 0013 4eaa 0013 0789 0013 4eb2 0013 0769 0013 4eba 0013 0745 0013 4ec2
2663100  0013 0725 0013 4eca 0013 0705 0013 4ed2 0013 06e5 0013 4eda 0013 06c5 0013 4ee2 0013 06a1 0013 4eea 0013 0681 0013 4ef2
2663160  0013 0661 0013 4efa 0013 0641 0013 4f02 0013 0621 0013 4f0a 0013 0601 0013 4f12 0013 05e1 0013 4f1a 0013 05c1 0013 4f22
2663240  0013 05a1 0013 4f2a 0013 0581 0013 4f32 0013 0561 0013 4f3a 0013 053d 0013 4f42 0013 051d 0013 4f4a 0013 04fd 0013 4f52
2663320  0013 04dd 0013 4f5a 0013 04bd 0013 4f62 0013 0499 0013 4f6a 0013 0479 0013 4f72 0013 0459 0013 4f7a 0013 0439 0013 4f82
2663400  0013 0419 0013 4f8a 0013 03f9 0013 4f92 0013 0319 0013 4f9a 0013 03b9 0013 4fa2 0013 0395 0013 4faa 0013 0375 0013 4fb2
2663460  0013 0355 0013 4fba 0013 0335 0013 4fc2 0013 0315 0013 4fca 0013 02f1 0013 4fd2 0013 02d1 0013 4fda 0013 02b1 0013 4fe2
2663540  0013 0291 0013 4fea 0013 0271 0013 4ff2 0013 0251 0013 4ffa 0013 0231 0013 5002 0013 0211 0013 500a 0013 01f1 0013 5012
2663620  0013 01d1 0013 501a 0013 01b1 0013 5022 0013 0191 0013 502a 0013 016d 0013 5032 0013 014d 0013 503a 0013 012d 0013 5042
2663700  0013 010d 0013 504a 0013 00ed 0013 5052 0013 00c9 0013 505a 0013 00a9 0013 5062 0013 0089 0013 506a 0013 0069 0013 5072
2663760  0013 0049 0013 507a 0013 0029 0013 5082 0013 0009 0013 508a 0012 ffe9 0013 5092 0012 ffc9 0013 509a 0012 ffa9 0013 50a2
2664040  0012 ff89 0013 50aa 0012 ff69 0013 50b2 0012 ff45 0013 50ba 0012 ff25 0013 50c2 0012 ff05 0013 50ca 0012 fee5 0013 50d2
2664120  0012 fec5 0013 50da 0012 fea1 0013 50e2 0012 fe81 0013 50ea 0012 fe61 0013 50f2 0012 fe41 0013 50fa 0012 fe21 0013 5102
2664200  0012 fe01 0013 510a 0012 fde1 0013 5112 0012 fdc1 0013 511a 0012 fda1 0013 5122 0012 fd81 0013 512a 0012 fd61 0013 5132
2664260  0012 fd41 0013 513a 0012 fd21 0013 5142 0012 fd01 0013 514a 0012 fce1 0013 5152 0012 fcc1 0013 515a 0012 fc9d 0013 5162
2664340  0012 fc7d 0013 516a 0012 fc5d 0013 5172 0200 0b3f 0000 2c47 0000 0013 0200 0b3f 0000 5ed7 0000 0073 0100 231f 0013 518d
2664420  0100 231f 0013 518d 0300 08af 0000 0247 0013 51b9 0013 51a1 0100 3077 0000 0013 0100 08af 0000 322f 0100 08af 0000 322f
2664500  0100 08af 0000 322f 0100 08af 0000 322f 0100 08af 0000 322f 0100 08af 0000 322f 0100 08af 0000 322f 0100 08af 0000 322f
*
2664640  0100 231f 0012 e325 0300 08af 0000 0247 0013 5249 0013 5231 0100 3077 0000 000b 0200 08af 0000 00cf 0013 525d 0100 1ff7
```

```
2664720 0000 3287 0200 08af 0000 009f 0013 5271 0100 3077 0000 0013 0200 0b3f 0000 2c47 0000 0013 0200 0b3f 0000 5ebf 0000 0053
2665000 0100 231f 0013 5285 0100 231f 0013 5285 0300 08af 0300 0247 0013 52b1 0013 5299 0100 3077 0000 0013 0100 08af 0000 322f
2665060 0100 08af 0000 322f 0100 08af 0000 322f 0100 08af 0000 322f 0100 08af 0000 322f 0100 08af 0000 322f 0100 08af 0000 322f
2665140 0100 08af 0000 322f 0100 08af 0000 322f 0100 08af 0000 322f 0100 231f 0012 e801 0300 08af 0000 0247 0013 5321 0013 5309
2665220 0100 3077 0000 000b 0200 08af 0000 00cf 0013 5335 0100 1ff7 0000 3287 0200 08af 0000 009f 0013 5349 0100 3077 0000 0013
2665300 0200 0b3f 0000 2c47 0000 0013 0200 0b3f 0000 63af 0300 0053 0100 231f 0013 535d 0100 231f 0013 535d 0300 08af 0000 0247
2665360 0013 5389 0013 5371 0100 3077 0000 0013 0100 08af 0000 322f 0100 08af 0000 322f 0100 08af 0000 322f 0100 08af 0000 322f
2665440 0100 08af 0000 322f 0100 08af 0000 322f 0100 08af 0000 322f 0100 08af 0000 322f 0100 08af 0000 322f 0100 08af 0000 322f
2665520 0100 231f 0012 ec0d 0300 08af 0000 0247 0013 53f9 0013 53e1 0100 3077 0000 000b 0200 08af 0000 00cf 0013 540d 0100 1ff7
2665600 0000 3287 0200 08af 0000 009f 0013 5421 0100 3077 0000 0013 0200 0b3f 0000 2c47 0000 0013 0200 0b3f 0000 32e7 0000 0033
2665660 0100 231f 0013 5435 0100 231f 0013 5435 0300 08af 0000 0247 0013 5461 0013 5449 0100 3077 0000 0013 0100 08af 0000 322f
2665740 0100 08af 0000 322f 0100 08af 0000 322f 0100 08af 0000 322f 0100 08af 0000 322f 0100 08af 0000 322f 0100 231f 0012 f019
2666020 0300 08af 0000 0247 0013 54b1 0013 5499 0100 3077 0000 000b 0200 08af 0000 00cf 0013 54c5 0100 1ff7 0000 3287 0200 08af
2666100 0000 009f 0013 54d9 0100 3077 0000 0013 0200 0b3f 0000 2c47 0000 0013 0200 0b3f 0000 53a7 0000 004b 0100 231f 0013 54ed
2666160 0100 231f 0013 54ed 0300 08af 0000 0247 0013 5519 0013 5501 0100 3077 0000 0013 0100 08af 0000 322f 0100 08af 0000 322f
2666240 0100 08af 0000 322f 0100 08af 0000 322f 0100 08af 0000 322f 0100 08af 0000 322f 0100 08af 0000 322f 0100 08af 0000 322f
2666320 0100 08af 0000 322f 0100 231f 0012 f355 0300 08af 0300 0247 0013 5581 0013 5569 0100 3077 0000 000b 0200 08af 0000 00cf
2666400 0013 5595 0100 1ff7 0000 3287 0200 08af 0000 009f 0013 55a9 0100 3077 0000 0013 0200 0b3f 0000 2c47 0000 0013 0200 0b3f
2666460 0000 642f 0000 003b 0100 231f 0013 55bd 0100 231f 0013 55bd 0300 08af 0000 0247 0013 55e9 0013 55d1 0100 3077 0000 0013
2666540 0100 08af 0000 322f 0100 08af 0000 322f 0100 08af 0000 322f 0100 08af 0000 322f 0100 08af 0000 322f 0100 08af 0000 322f
2666620 0100 08af 0000 322f 0100 231f 0012 f72d 0300 08af 0000 0247 0013 5641 0013 5629 0100 3077 0000 000b 0200 08af 0000 00cf
2666700 0013 5655 0100 1ff7 0000 3287 0200 08af 0000 009f 0013 5669 0100 3077 0000 0013 0200 0b3f 0000 2c47 0000 0013 0200 0b3f
2666760 0000 630f 0000 0023 0100 231f 0013 567d 0100 231f 0013 567d 0300 08af 0000 0247 0013 56a9 0013 5691 0100 3077 0000 0013
2667040 0100 08af 0000 322f 0100 08af 0000 322f 0100 08af 0000 322f 0100 08af 0000 322f 0100 231f 0012 fa91 0300 08af 0000 0247
2667120 0013 56e9 0013 56d1 0100 3077 0000 000b 0200 08af 0000 00cf 0013 56fd 0100 1ff7 0000 3287 0200 08af 0000 009f 0013 5711
2667200 0100 3077 0000 0013 0013 4dd1 0000 0007 0013 5729 0000 0007 0200 08af 0000 060f 0012 f995 0013 5729 0000 0007 0013 5729
2667260 0000 0007 0013 5729 0000 0007 0013 5705 0013 5746 0013 56f1 0013 574e 0013 56d9 0013 5756 0013 56d9 0013 5756 0013 56d9
2667340 0013 5756 0013 577d 0013 578a 0200 08af 0000 0077 0000 000b 0013 56d9 0013 5756 0013 577d 0013 578a 0013 57a1 0013 578a
2667420 0200 08af 0000 0077 0000 0013 0013 57a1 0013 578a 0013 57bd 0013 578a 0200 08af 0000 0077 0000 001b 0013 57bd 0013 578a
2667500 0013 57d9 0013 578a 0200 08af 0000 0077 0000 0023 0013 57d9 0013 578a 0013 5699 0013 57e6 0012 f621 0013 57ee 0012 f621
2667560 0013 57ee 0012 f621 0013 57ee 0013 565d 0013 5806 0013 5649 0013 580e 0013 5631 0013 5816 0013 5631 0013 5816 0013 5631
2667640 0013 5816 0013 583d 0013 584a 0200 08af 0000 0077 0000 000b 0013 5631 0013 5816 0013 583d 0013 584a 0013 5861 0013 584a
2667720 0200 08af 0000 0077 0000 0013 0013 5861 0013 584a 0013 587d 0013 584a 0000 002c 0013 841c b27c b66c 0000 0d5e 7fff ffff
2670000 0013 387c 0200 04b5 0200 2f35 0000 6aef 0000 0383 0000 315f 0000 002c 0013 8448 b27c b66c 0000 0d66 7fff ffff 0013 38a8
2670060 0200 0db5 0200 224d 0000 6aef 000c 3297 0000 315f 0011 7265 6769 7374 6572 5f64 6973 7461 6e63 6500 0013 5a18 0000 0090
2670140 b27c b66c 0000 0460 0000 0d65 000a d16d 0200 0db5 0200 270d 0000 6aef 0000 3287 0000 315f 0013 5950 0000 0038 b27c b66c
2670220 0000 0d61 0000 0d67 0013 5a1c 0200 0db5 0500 1cdd 0000 6c0f 0000 001b 0000 3287 009d 1863 0000 0383 0000 315f 0013 5a18
2670300 0000 002c b4f0 b4e4 0000 0d60 7fff ffff 0008 b0dd 0000 0000 0000 0000 0013 5a8c 0002 438a 000b 5218 2c78 009c 0002 438a
2670360 45e8 0024 4728 001c 4754 2e7c ae74 0028 2ba0 002c 0022 3c9c 0000 0024 000d 7d48 002c aa88 0028 2e98 37c4 0024 31a4 4a7c
2670440 0014 2c88 0010 2c58 32b8 56f8 6e1c 0024 5370 bfcc 2e7c ae74 0020 2ba0 0024 0020 3af4 001c 000d 7d48 0024 aa89 0020 2e98
2670520 37c4 001c 31bc 4a7c 0018 2c88 0010 2c58 32d4 56f8 6e1c 001c 5370 bfcc 33a0 3d48 40f4 0000 000c 4118 0014 37f0 3cf4 234c
2670600 0013 a32c 0013 5a88 0000 0038 b27c b66c 0000 0d62 0000 0d68 0013 5a8c 0200 0db5 0500 1cdd 0000 6c0f 0000 0013 0000 3287
2670660 009d 1963 0000 0383 0000 315f 27f0 0038 0013 a394 45dc 46ec 3c48 0000 000d 7d48 001c 2ecc 3348 3aa0 0013 a364 0018 3310
2670740 40f4 0000 0011 4914 0014 37f0 3cf4 234c 0013 a384 0013 5be8 0000 0038 b130 b66c 0000 0d63 0000 0d69 0013 5955 0200 0db5
2671020 0500 1cdd 0000 64bf 0000 0013 0000 3287 0093 1c23 0000 0383 0000 315f 28c4 0030 0013 5aec 56f8 4af8 0000 0a87 55f0 4af8
2671100 0000 0ab7 55f0 4af8 0000 0ad7 55f0 4af8 0000 0b3f 5370 50f0 0000 479b 28c4 0030 0013 5b1c 56f8 4af8 0000 0a87 55f0 4af8
2671160 0000 0ab7 55f0 4af8 0000 0ad7 55f0 4af8 0000 0de7 5370 50f0 0000 4cab 28c4 0030 0013 5b4c 56f8 4af8 0000 0a87 55f0 4af8
2671240 0000 0ab7 55f0 4af8 0000 0b3f 55f0 4af8 0000 0de7 5370 50f0 0000 4bab 28c4 0030 0013 5b7c 56f8 4af8 0000 0a87 55f0 4af8
2671320 0000 0ad7 55f0 4af8 0000 0b3f 55f0 4af8 0000 0de7 5370 50f0 0000 4cab 28c4 0030 0013 5bac 56f8 4af8 0000 0ab7 55f0 4af8
2671400 0000 0ad7 55f0 4af8 0000 0b3f 55f0 4af8 0000 0de7 5370 50f0 0000 4cab 2954 0038 0002 438a 56f8 4af8 0000 0a87 55f0 4af8
2671460 0000 0ab7 55f0 4af8 0000 0ad7 55f0 4af8 0000 0b3f 55f0 4af8 0000 0de7 5370 50f0 0000 4cab 0013 82f8 0000 1ca0 7573 7465
2671540 7273 2843 6c75 7374 6572 732c 2044 6573 6967 6e29 2c0a 0970 7574 6462 5f64 6573 6967 6e28 5f2c 2044 6573 6967 6e29 2c0a
2671620 0966 6f72 6d61 7428 2720 2020 2020 4465 7369 676e 3a20 7e77 7e6e 272c 205b 4465 7369 676e 5d29 2c0a 0970 7574 6462 5f63
2671700 6c75 7374 6572 5f73 6574 7328 5f2c 2052 6573 7429 2e0a 090a 7075 7464 625f 636c 7573 7465 7273 285f 2c20 436c 7573 7465
2671760 7273 2920 3a2d 0a09 2865 7869 7374 735f 636c 7573 7465 7273 2843 6c75 7374 6572 7329 2c20 213b 0a09 2070 7574 6462 2863
```

```
2672040  6c75 7374 6572 7328 436c 7573 7465 7273 2929 292e 0a0a 7075 7464 625f 6465 7369 676e 285f 2c20 4465 7369 676e 2920 3a2d
2672120  0a09 2865 7869 7374 735f 6465 7369 676e 2844 6573 6967 6e29 2c20 213b 0a09 2070 7574 6462 2864 6573 6967 6e28 4465 7369
2672200  676e 2929 292e 0a0a 6578 6973 7473 5f64 6573 6967 6e28 4429 203a 2d0a 0967 6574 6462 2864 6573 6967 6e28 4429 292e 0a0a
2672260  6578 6973 7473 5f63 6c75 7374 6572 7328 4329 203a 2d0a 0967 6574 6462 2863 6c75 7374 6572 7328 4329 292e 0a0a 2525 2525
2672340  2525 2525 2525 2525 2525 2525 2525 2525 2525 2525 2525 2525 2525 2525 2525 2525 2525 2525 2525 2525 2525 2525 2525 2525
2672420  2525 2525 2525 2525 2525 2525 2525 2525 2525 2525 2525 2525 2525 0a25 2525 2520 4765 6e65 7261 7465 2064 6973 7461 6e63
2672500  6520 6d61 7472 6978 2e0a 0a3a 2120 6479 6e61 6d69 6320 6469 7374 616e 6365 2f33 2e0a 0a63 6f6d 7075 7465 5f64 6973 7461
2672560  6e63 655f 6d61 7472 6978 2844 6973 7446 6e29 203a 2d0a 0966 696e 6461 6c6c 284f 7049 642c 206f 7065 7261 746f 725f 616e
2672640  645f 6964 285f 4f70 2c20 4f70 4964 292c 204f 7065 7261 746f 7249 6473 292c 0a09 636f 6d70 7574 655f 6469 7374 616e 6365
2672720  5f6d 6174 7269 7828 4469 7374 466e 2c20 4f70 6572 6174 6f72 4964 7329 2e0a 0a63 6f6d 7075 7465 5f64 6973 7461 6e63 655f
2673000  6d61 7472 6978 284e 6f64 6573 2c20 4469 7374 466e 2920 3a2d 0a09 636f 6d62 696e 6174 696f 6e5f 7365 7428 4e6f 6465 732c
2673060  2043 6f6d 6253 6574 292c 0a09 6469 7374 5f70 6169 7228 4469 7374 466e 2c20 436f 6d62 5365 7429 2e0a 0a64 6973 745f 7061
2673140  6972 285f 2c20 5b5d 292e 0a64 6973 745f 7061 6972 2944 6973 7446 6e2c 205b 4e6f 6465 312d 4e6f 6465 327c 5265 7374 5d29
2673220  203a 2d0a 0964 6973 7461 6e63 655f 6175 7828 4469 7374 466e 2c20 4e6f 6465 312c 204e 6f64 6532 2c20 5f44 6973 7461 6e63
2673300  6529 2c20 212c 0a09 6469 7374 5f70 6169 7228 4469 7374 466e 2c20 5265 7374 292e 0a0a 6469 7374 616e 6365 5f61 7578 2844
2673360  6973 7446 6e2c 204f 7049 6431 2c20 4f70 4964 322c 2044 6973 7461 6e63 6529 203a 2d0a 0928 0a09 0963 6f6d 7075 7465 5f64
2673440  6973 7461 6e63 6528 4469 7374 466e 2c20 4f70 4964 312c 204f 7049 6432 2c20 4469 7374 616e 6365 292c 0a09 0970 7574 6462
2673520  5f64 6973 7461 6e63 6528 4f70 4964 312c 204f 7049 6432 2c20 4469 7374 616e 6365 290a 093b 0a09 0974 7275 650a 0929 2e0a
2673600  0a25 2520 636f 6170 7574 6520 6469 7374 616e 6365 2075 7369 6e67 2073 7065 6369 6669 6564 2064 6973 7461 6e63 6520 6675
2673660  6e63 7469 6f6e 0a0a 636f 6d70 7574 655f 6469 7374 616e 6365 2862 7564 5f64 6973 7461 6e63 652c 204f 7049 6431 2c20 4f70
2673740  4964 322c 2044 6973 7461 6e63 6529 203a 2d20 212c 0a09 6275 645f 6469 7374 616e 6365 284f 7049 6431 2c20 4f70 4964 322c
2674020  2031 2c20 312c 2044 6973 7461 6e63 6529 2e0a 636f 6d70 7574 655f 6469 7374 616e 6365 2862 7564 5f64 6973 7461 6e63 6532
2674100  2c20 4f70 4964 312c 204f 7049 6432 2c20 4469 7374 616e 6365 2920 3a2d 2021 2c0a 0962 7564 5f64 6973 7461 6e63 6532 284f
2674160  7049 6431 2c20 4f70 4964 322c 2031 2c20 312c 2044 6973 7461 6e63 6529 2e0a 636f 6d70 7574 655f 6469 7374 616e 6365 2844
2674240  6973 7446 6e2c 204f 7049 6431 2c20 4f70 4964 322c 2044 6973 7461 6e63 6529 203a 2d0a 0963 616c 6c28 4469 7374 466e 2c20
2674320  4f70 4964 312c 204f 7049 6432 2c20 4469 7374 616e 6365 292e 0a0a 2525 2064 6174 6162 7365 2061 6363 6573 730a 090a 7075
2674400  7464 625f 6469 7374 616e 6365 284f 7049 6431 2c20 4f70 4964 322c 2044 6973 7461 6e63 6529 203a 2d0a 0928 2865 7869 7374
2674460  735f 6469 7374 616e 6365 284f 7049 6431 2c20 4f70 4964 322c 2044 6973 7461 6e63 6529 3b0a 0920 2065 7869 7374 735f 6469
2674540  7374 616e 6365 284f 7049 6432 2c20 4f70 4964 312c 2044 6973 7461 6e63 6529 292c 2021 3b0a 0970 7574 6462 2864 6973 7461
2674620  6e63 6528 4f70 4964 312c 204f 7049 6432 2c20 4469 7374 616e 6365 2929 292e 0a0a 6578 6973 7473 5f64 6973 7461 6e63 6528
2674700  4f70 4964 312c 204f 7049 6432 2c20 4469 7374 616e 6365 2920 3a2d 0a09 6765 7464 6228 6469 7374 616e 6365 284f 7049 6431
2674760  2c20 4f70 4964 322c 2044 6973 7461 6e63 6529 292e 0a0a 2525 2525 2525 2525 2525 2525 2525 2525 2525 2525 2525 2525 2525
2675040  2525 2525 2525 2525 2525 2525 2525 2525 2525 2525 2525 2525 2525 2525 2525 2525 2525 2525 2525 2525 2525 2525 2525 2525
2675120  2525 2525 0a25 2525 2520 5375 7070 6f72 7420 7072 6564 6963 6174 6573 2066 6f72 2064 6573 6967 6e73 2066 726f 6d20 636c
2675200  7573 7465 7273 0a0a 6465 7369 676e 735f 6672 6f6d 5f70 726f 6362 6f64 7928 5072 6f63 426f 6479 4964 2c20 4465 7369 676e
2675260  7329 3a2d 0a09 6465 7369 676e 735f 6672 6f6d 5f70 726f 6362 6f64 7928 5072 6f63 426f 6479 4964 2c20 4465 7369 676e 732c
2675340  2062 7564 5f64 6973 7461 6e63 6529 2e0a 0a64 6573 6967 6e73 5f66 726f 6d5f 7072 6f63 626f 6479 2850 726f 6342 6f64 7949
2675420  642c 2044 6573 6967 6e73 2c20 4469 7374 466e 293a 2d0a 0970 726f 6362 6f64 795f 6f70 6572 6174 6f72 5f63 6c75 7374 6572
2675500  7328 5072 6f63 426f 6479 4964 2c20 4469 7374 466e 292c 0a09 6669 6e64 616c 6c28 4465 7369 676e 2c20 2863 6c75 7374 6572
2675560  7328 436c 7573 7465 7273 292c 0a09 2020 2020 2020 2020 2020 2020 2020 2020 2064 6573 6967 6e5f 6672 6f6d 5f63 6c75 7374
2675640  6572 7328 436c 7573 7465 7273 2c44 6573 6967 6e29 292c 2044 6573 6967 6e73 292e 0a0a 6465 7369 676e 5f66 726f 6d5f 636c
2675720  7573 7465 7273 285b 5d2c 205b 5d29 2e0a 6465 7369 676e 5f66 726f 6d5f 636c 7573 7465 7273 285b 436c 7573 7465 727c 436c
2676000  7573 7465 7273 5d2c 205b 4465 7369 676e 7c44 6573 6967 6e73 5d29 203a 2d0a 0964 6573 6967 6e5f 6672 6f6d 5f63 6c75 7374
2676060  6572 735f 6175 7828 436c 7573 7465 722c 2044 6573 6967 6e29 2c0a 0964 6573 6967 6e5f 6672 6f6d 5f63 6c75 7374 6572 7328
2676140  436c 7573 7465 7273 2c20 4465 7369 676e 7329 2e0a 090a 6465 7369 676e 5f66 726f 6d5f 636c 7573 7465 7273 5f61 7578 285b
2676220  5d2c 205b 5d29 2e0a 6465 7369 676e 5f66 726f 6d5f 636c 7573 7465 7273 5f61 7578 285b 4f70 4964 7c4f 7049 6473 5d2c 205b
2676300  4f70 4e75 6d7c 4f70 4e75 6d73 5d29 203a 2d0a 096f 7065 7261 746f 725f 6964 5f61 6e64 5f6e 756d 6265 7228 4f70 4964 2c20
2676360  4f70 4e75 6d29 2c0a 0964 6573 6967 6e5f 6672 6f6d 5f63 6c75 7374 6572 735f 6175 7828 4f70 4964 732c 204f 704e 756d 7329
2676440  2e0a 0a25 2525 2525 2525 2525 2525 2525 2525 2525 2525 2525 2525 2525 2525 2525 2525 2525 2525 2525 2525 2525 2525 2525
2676520  2525 2525 2525 2525 2525 2525 2525 2525 2525 2525 2525 2525 2525 2525 2525 2525 250a 2525 2525 2056 6172 6961 626c 6573
2676600  2061 7320 636f 6e6e 6563 7469 6f6e 7320 746f 206f 7065 7261 746f 7273 0a0a 2525 2525 204f 7065 7261 746f 7220 636c 7573
2676660  7465 7273 204f 7049 644c 6973 7431 2061 6e64 204f 7069 644c 6973 7432 2068 6176 6520 636f 6d6d 6f6e 2063 6f6e 6e65 6374
2676740  696f 6e73 2069 6620 0a25 2525 2520 6f6e 6520 6f72 206d 6f72 6520 6f66 2074 6865 2066 6f6c 6c6f 7769 6e67 2069 7320 7472
2677020  7565 2e0a 2525 2525 2031 2e20 626f 7468 2075 7365 2074 6865 2073 616d 6520 696e 7075 7420 7661 7269 6162 6c65 2873 290a
2677100  2525 2525 2032 2e20 626f 7468 2075 7365 2074 6865 2073 616d 6520 6f75 7470 7574 2076 6172 6961 626c 6528 7329 0a25 2525
```

```
2677160 2520 332e 2069 6e70 7574 206f 6620 6f6e 6520 6973 2074 6865 206f 7574 7075 7420 6f66 2074 6865 206f 7468 6572 2e0a 2525
2677240 2525 2049 6e20 616c 6c20 7468 6573 6520 6361 7365 732c 2074 6865 2063 6f6d 6d6f 6e20 636f 6e6e 6563 7469 6f6e 7320 6172
2677320 6520 6e6f 7465 6420 616e 6420 6164 6465 6420 7570 2e0a 0a63 6f6d 6d6f 6e5f 636f 6e6e 6563 7469 6f6e 7328 4f70 4964 312c
2677400 204f 7049 6432 2c20 436f 6d6d 6f6e 436f 6e6e 2920 3a2d 0a09 2869 735f 6c69 7374 284f 7049 6431 2920 2d3e 204f 7049 644c
2677460 6973 7431 203d 204f 7049 6431 203b 204f 7049 644c 6973 7431 203d 205b 4f70 4964 315d 292c 0a09 2869 735f 6c69 7374 284f
2677540 7049 6432 2920 2d3e 204f 7049 644c 6973 7432 203d 204f 7049 6432 203b 204f 7049 644c 6973 7432 203d 205b 4f70 4964 325d
2677620 292c 0a09 636f 6d6d 6f6e 5f63 6f6e 6e65 6374 696f 6e73 5f61 7578 284f 7049 644c 6973 7431 2c20 4f70 4964 4c69 7374 322c
2677700 2043 6f6d 6d6f 6e43 6f6e 6e29 2e0a 0a25 2520 5468 6520 2269 6e70 7574 7322 2061 6e64 2022 6f75 7470 7574 7322 2066 6965
2677760 6c64 206f 6620 616e 206f 7065 7261 746f 7220 7265 6665 7220 746f 2074 6865 200a 2525 2069 6f6e 6f64 6573 2061 6e64 206e
2700040 6f74 2074 6f20 7468 6520 6163 7475 616c 2076 6172 6961 626c 6573 2e20 536f 2077 6520 6861 7665 2074 6f20 6578 7472 6163
2700120 740a 2525 2074 6865 2069 6420 6f66 2074 6865 2076 6172 6961 626c 6520 6672 6f6d 2074 6865 2069 6f6e 6f64 6520 696e 666f
2700200 726d 6174 696f 6e2e 2048 656e 6365 0a25 2520 7468 6520 6e65 6564 2066 6f72 2061 2064 6966 6665 7265 6e74 2073 6574 206f
2700260 6620 7072 6564 6963 6174 6573 2e0a 2525 2028 7669 7a2e 206f 7065 7261 746f 725f 626c 6f63 6b5f 696e 7075 745f 7661 7273
2700340 2f32 2020 616e 6420 6f70 6572 6174 6f72 5f62 6c6f 636b 5f6f 7574 7075 745f 7661 7273 2f32 292e 0a0a 636f 6d6d 6f6e 5f63
2700420 6f6e 6e65 6374 696f 6e73 5f61 7578 284f 7049 644c 6973 7431 2c20 4f70 4964 4c69 7374 322c 2043 6f6d 6d6f 6e43 6f6e 6e29
2700500 203a 2d0a 096f 7065 7261 746f 725f 626c 6f63 6b5f 696e 7075 745f 7661 7273 284f 7049 644c 6973 7431 2c20 496e 4c69 7374
2700560 3129 2c0a 096f 7065 7261 746f 725f 626c 6f63 6b5f 6f75 7470 7574 5f76 6172 7328 4f70 4964 4c69 7374 312c 204f 7574 4c69
2700640 7374 3129 2c0a 0961 7070 656e 6428 496e 4c69 7374 312c 204f 7574 4c69 7374 312c 204c 6973 7431 292c 0a09 6f70 6572 6174
2700720 6f72 5f62 6c6f 636b 5f69 6e70 7574 5f76 6172 7328 4f70 4964 4c69 7374 322c 2049 6e4c 6973 7432 292c 0a09 6f70 6572 6174
2701000 6f72 5f62 6c6f 636b 5f6f 7574 7075 745f 7661 7273 284f 7049 644c 6973 7432 2c20 4f75 744c 6973 7432 292c 0a09 6170 7065
2701060 6e64 2849 6e4c 6973 7432 2c20 4f75 744c 6973 7432 2c20 4c69 7374 3229 2c0a 0969 6e74 6572 7365 6374 696f 6e28 4c69 7374
2701140 312c 204c 6973 7432 2c20 436f 6d6d 6f6e 4c69 7374 292c 0a09 6c65 6e67 7468 2843 6f6d 6d6f 6e4c 6973 742c 2043 6f6d 6d6f
2701220 6e43 6f6e 6e29 2e0a 0a25 2525 2520 546f 7461 6c20 636f 6e6e 6563 7469 6f6e 7320 6f66 206f 7065 7261 746f 7220 636c 7573
2701300 7465 7273 204f 7049 644c 6973 7431 2061 6e64 204f 7049 644c 6973 7432 2069 7320 0a25 2525 2520 7369 6d70 6c79 2074 6865
2701360 2073 756d 206f 6620 7468 6520 6e75 6d62 6572 206f 6620 696e 7075 7473 2061 6e64 206f 7574 7075 7473 206f 6620 6561 6368
2701440 206f 7065 7261 746f 722e 0a0a 2525 2053 696e 6365 2077 6520 6172 6520 696e 7465 7265 7374 6564 206f 6e6c 7920 696e 2074
2701520 6865 2074 6f74 616c 206e 756d 6265 7220 6f66 2069 6e70 7574 7320 616e 6420 6f75 7470 7574 730a 2525 2061 6e64 206e 6f74
2701600 2072 6561 6c6c 7920 7468 6520 7661 7269 6162 6c65 7320 7468 6174 2063 6f72 7265 7370 6f6e 6420 746f 2074 6865 2069 6f27
2701660 732c 2077 6520 6361 6e20 7573 650a 2525 2074 6865 2063 6f6e 7465 6e74 7320 6f66 2074 6865 2022 696e 7075 7473 2220 616e
2701740 6420 226f 7574 7075 7473 2220 6669 656c 6420 6f66 2074 6865 206f 7065 7261 746f 7220 746f 0a25 2520 636f 756e 7420 7468
2702020 6520 6e75 6d62 6572 2e0a 0a74 6f74 616c 5f63 6f6e 6e65 6374 696f 6e73 284f 7049 6431 2c20 4f70 4964 322c 2054 6f74 616c
2702100 2920 3a2d 0a09 746f 7461 6c5f 636f 6e6e 6563 7469 6f6e 7328 4f70 4964 312c 204f 7049 6432 2c20 546f 7461 6c31 2c20 546f
2702160 7461 6c32 292c 0a09 546f 7461 6c20 6973 2054 6f74 616c 3120 2b20 546f 7461 6c32 2e0a 0a74 6f74 616c 5f63 6f6e 6e65 6374
2702240 696f 6e73 284f 7049 6431 2c20 4f70 4964 322c 2054 6f74 616c 312c 2054 6f74 616c 3229 203a 2d0a 0928 6973 5f6c 6973 7428
2702320 4f70 4964 3129 202d 3e20 4f70 4964 4c69 7374 3120 3d20 4f70 4964 3120 3b20 4f70 4964 4c69 7374 3120 3d20 5b4f 7049 6431
2702400 5d29 2c0a 0928 6973 5f6c 6973 7428 4f70 4964 3229 202d 3e20 4f70 4964 4c69 7374 3220 3d20 4f70 4964 3220 3b20 4f70 4964
2702460 4c69 7374 3220 3d20 5b4f 7049 6432 5d29 2c0a 0974 6f74 616c 5f63 6f6e 6e65 6374 696f 6e73 5f61 7578 284f 7049 644c 6973
2702540 7431 2c4f 7049 644c 6973 7432 2c54 6f74 616c 312c 546f 7461 6c32 292e 0a0a 746f 7461 6c5f 636f 6e6e 6563 7469 6f6e 735f
2702620 6175 7820 4f70 4964 4c69 7374 312c 204f 7049 644c 6973 7432 2c20 546f 7461 6c31 2c20 546f 7461 6c32 2920 3a2d 0a09 6f70
2702700 6572 6174 6f72 5f62 6c6f 636b 5f69 6e70 7574 5f69 6473 284f 7049 644c 6973 7431 2c20 496e 7075 7473 3129 2c0a 096f 7065
2702760 7261 746f 725f 626c 6f63 6b5f 6f75 7470 7574 5f69 6473 284f 7049 644c 6973 7431 2c20 4f75 7470 7574 7331 292c 0a09 6f70
2703040 6572 6174 6f72 5f62 6c6f 636b 5f69 6e70 7574 5f69 6473 284f 7049 644c 6973 7432 2c20 496e 7075 7473 3229 2c0a 096f 7065
2703120 7261 746f 725f 626c 6f63 6b5f 6f75 7470 7574 5f69 6473 284f 7049 644c 6973 7432 2c20 4f75 7470 7574 7332 292c 0a09 6c65
2703200 6e67 7468 2849 6e70 7574 7331 2c20 4931 292c 0a09 6c65 6e67 7468 284f 7574 7075 7473 312c 204f 3129 2c0a 096c 656e 6774
2703260 6828 496e 7075 7473 322c 2049 3229 2c0a 096c 656e 6774 6828 4f75 7470 7574 7332 2c20 4f32 292c 0a09 546f 7461 6c31 2069
2703340 7320 4931 2b4f 312c 0a09 546f 7461 6c32 2069 7320 2049 322b 4f32 2e0a 0a25 2525 2520 466f 7220 7468 6520 7361 6b65 206f
2703420 6620 6566 6669 6369 656e 6379 2074 6865 2074 776f 2070 7265 6469 6361 7465 7320 6162 6f76 6520 6172 6520 6d65 7267 6564
2703500 0a25 2525 2520 696e 746f 2061 2073 696e 676c 6520 7072 6564 6963 6174 6520 6265 6c6f 773a 0a0a 6f70 6572 6174 6f72 5f63
2703560 6c75 7374 6572 5f63 6f6e 6e65 6374 696f 6e73 284f 7049 6431 2c20 4f70 4964 322c 2054 6f74 616c 312c 2054 6f74 616c 322c
2703640 2043 6f6d 6d6f 6e29 203a 2d0a 0928 6973 5f6c 6973 7428 4f70 4964 3129 202d 3e20 4f70 4964 4c69 7374 3120 3d20 4f70 4964
2703720 3120 3b20 4f70 4964 4c69 7374 3120 3d20 5b4f 7049 6431 5d29 2c0a 0928 6973 5f6c 6973 7428 4f70 4964 3229 202d 3e20 4f70
2704000 4964 4c69 7374 3220 3d20 4f70 4964 3220 3b20 4f70 4964 4c69 7374 3220 3d20 5b4f 7049 6432 5d29 2c0a 096f 7065 7261 746f
2704060 725f 636c 7573 7465 725f 636f 6e6e 6563 7469 6f6e 735f 6175 7828 4f70 4964 4c69 7374 312c 4f70 4964 4c69 7374 322c 546f
2704140 7461 6c31 2c0a 0920 2020 2020 2020 2020 2020 2020 2020 2020 2020 2020 2020 2020 2020 2020 2020 2020 546f 7461 6c32 2c43
2704220 6f6d 6d6f 6e29 2e0a 0a6f 7065 7261 746f 725f 636c 7573 7465 725f 636f 6e6e 6563 7469 6f6e 735f 6175 7828 4f70 4964 4c69
```

```
2704300 7374 312c 4f70 4964 4c69 7374 322c 546f 7461 6c31 2c54 6f74 616c 322c 436f 6d6d 6f6e 2920 3a2d 0a09 6f70 6572 6174 6f72
2704360 5f62 6c6f 636b 5f69 6e70 7574 5f76 6172 7328 4f70 4964 4c69 7374 312c 2049 6e4c 6973 7431 292c 0a09 6f70 6572 6174 6f72
2704440 5f62 6c6f 636b 5f6f 7574 7075 745f 7661 7273 284f 7049 644c 6973 7431 2c20 4f75 744c 6973 7431 292c 0a09 6170 7065 6e64
2704520 2849 6e4c 6973 7431 2c20 4f75 744c 6973 7431 2c20 4c69 7374 3129 2c0a 096f 7065 7261 746f 725f 626c 6f63 6b5f 696e 7075
2704600 745f 7661 7273 284f 7049 644c 6973 7432 2c20 496e 4c69 7374 3229 2c0a 096f 7065 7261 746f 725f 626c 6f63 6b5f 6f75 7470
2704660 7574 5f76 6172 7328 4f70 4964 4c69 7374 322c 204f 7574 4c69 7374 3229 2c0a 0961 7070 656e 6428 496e 4c69 7374 322c 204f
2704740 7574 4c69 7374 322c 204c 6973 7432 292c 0a09 696e 7465 7273 6563 7469 6f6e 284c 6973 7431 2c20 4c69 7374 322c 2043 6f6d
2705020 6d6f 6e4c 6973 7429 2c0a 096c 656e 6774 6828 4c69 7374 312c 2054 6f74 616c 3129 2c0a 096c 656e 6774 6828 4c69 7374 322c
2705100 2054 6f74 616c 3229 2c0a 096c 656e 6774 6828 436f 6d6d 6f6e 4c69 7374 2c20 436f 6d6d 6f6e 292e 0a0a 2525 2525 2525 2525
2705160 2525 2525 2525 2525 2525 2525 2525 2525 2525 2525 2525 2525 2525 2525 2525 2525 2525 2525 2525 2525 2525 2525 2525 2525
2705240 2525 2525 2525 2525 2525 2525 2525 2525 2525 2525 2525 0a0a 656e 645f 6f66 5f66 696c 652e 0a0a 2525 2525 2525 2525 2525
2705320 2525 2525 2525 2525 2525 2525 2525 2525 2525 2525 2525 2525 2525 2525 2525 2525 2525 2525 2525 2525 2525 2525 2525 2525
2705400 2525 2525 2525 2525 2525 2525 2525 2525 2525 2525 0a25 2525 2520 5465 7374 2063 6f64 650a 2f2a 0a3a 2d20 6479 6e61 6d69
2705460 6320 7265 6769 7374 6572 5f64 6973 7461 6e63 652f 332e 0a3a 2d20 6479 6e61 6d69 6320 6675 6e63 7469 6f6e 5f64 6973 7461
2705540 6e63 652f 332e 0a0a 7270 726f 7861 6c6c 203a 2d0a 0928 0a09 2020 2072 7072 6f78 312c 0a09 2020 2066 6169 6c0a 093b 0a09
2705620 2020 2074 7275 650a 0929 2e0a 0a72 7072 6f73 3120 3a2d 0a09 6578 6973 7473 5f6f 7065 7261 746f 7228 4f70 3129 2c0a 096f
2705700 7065 7261 746f 725f 6964 284f 7031 2c20 4f70 4964 3129 2c0a 0965 7869 7374 735f 6f70 6572 6174 6f72 284f 7032 292c 0a09
2705760 6f70 6572 6174 6f72 5f69 6428 4f70 322c 204f 7049 6432 292c 0a09 4f70 4964 3120 5c3d 3d20 4f70 4964 322c 0a09 7265 6769
2706040 7374 6572 5f70 726f 7869 6d69 7479 284f 7031 2c20 4f70 322c 2053 636f 7265 292c 0a09 4469 7374 616e 6365 2069 7320 312e
2706120 3020 2d20 5363 6f72 652c 0a09 6173 7365 7274 5f72 6567 6973 7465 725f 6469 7374 616e 6365 284f 7049 6431 2c20 4f70 4964
2706200 322c 2044 6973 7461 6e63 6529 2c0a 0966 6f72 6d61 7428 277e 7720 2d20 7e77 203a 207e 3266 7e6e 272c 5b4f 7049 6431 2c4f
2706260 7049 6432 2c44 6973 7461 6e63 655d 292e 0a0a 6173 7365 7274 5f72 6567 6973 7465 725f 6469 7374 616e 6365 284f 7049 6431
2706340 2c20 4f70 4964 322c 2044 6973 7461 6e63 6529 203a 2d0a 0928 7265 6769 7374 6572 5f64 6973 7461 6e63 6528 4f70 4964 312c
2706420 204f 7049 6432 2c20 4469 7374 616e 6365 292c 2021 3b0a 0920 6173 7365 7274 2872 6567 6973 7465 725f 6469 7374 616e 6365
2706500 284f 7049 6431 2c20 4f70 4964 322c 2044 6973 7461 6e63 6529 2929 2e0a 0a66 7072 6f78 616c 6c20 3a2d 0a09 280a 0920 2020
2706560 6670 726f 7831 2c0a 0920 2020 6661 696c 0a09 3b0a 0920 2020 7472 7565 0a09 292e 0a0a 6670 726f 7831 203a 2d0a 0965 7869
2706640 7374 735f 6f70 6572 6174 6f72 284f 7031 292c 0a09 6f70 6572 6174 6f72 5f69 6428 4f70 312c 204f 7049 6431 292c 0a09 6578
2706720 6973 7473 5f6f 7065 7261 746f 7228 4f70 3229 2c0a 096f 7065 7261 746f 725f 6964 284f 7032 2c20 4f70 4964 3229 2c0a 094f
2707000 7049 6431 205c 333d 204f 7049 6432 2c0a 0966 756e 6374 696f 6e61 6c5f 7072 6f78 696d 6974 7928 4f70 312c 204f 7032 2c20
2707060 5363 6f72 6529 2c0a 0944 6973 7461 6e63 6520 6973 2031 202d 2053 636f 7265 2c0a 0961 7373 6572 745f 6675 6e63 7469 6f6e
2707140 5f64 6973 7461 6e63 6528 4f70 4964 312c 204f 7049 6432 2c20 4469 7374 616e 6365 292c 0a09 666f 726d 6174 2827 7e77 202d
2707220 207e 7720 3a20 7e32 667e 6e27 2c5b 4f70 4964 312c 4f70 4964 322c 4469 7374 616e 6365 5d29 2e0a 0a61 7373 6572 745f 6675
2707300 6e63 7469 6f6e 5f64 6973 7461 6e63 6528 4f70 4964 312c 204f 7049 6432 2c20 4469 7374 616e 6365 2920 3a2d 0a09 2866 756e
2707360 6374 696f 6e5f 6469 7374 616e 6365 284f 7049 6431 2c20 4f70 4964 322c 2044 6973 7461 6e63 6529 2c20 213b 0a09 2061 7373
2707440 6572 7428 6675 6e63 7469 6f6e 5f64 6973 7461 6e63 6528 4f70 4964 312c 204f 7049 6432 2c20 4469 7374 616e 6365 2929 292e
2707520 0a0a 7061 7261 6c6c 203a 2d0a 0928 0a09 2020 2070 6172 312c 0a09 2020 2066 6169 6c0a 093b 0a09 2020 2074 7275 650a 0929
2707600 2e0a 0a70 6172 3120 3a2d 0a09 6578 6973 7473 5f6f 7065 7261 746f 7228 4f70 3129 2c0a 096f 7065 7261 746f 725f 6e75 6d62
2707660 6572 284f 7031 2c20 4e31 292c 0a09 6578 6973 7473 5f6f 7065 7261 746f 7228 4f70 3229 2c0a 096f 7065 7261 746f 725f 6e75
2707740 6d62 6572 284f 7032 2c20 4e32 292c 0a09 4e31 205c 0017 636c 7573 7465 725f 7365 7473 5f66 726f 6d5f 6e6f 6465 7300 0db5
2710020 0015 6765 6e65 7261 7465 5f63 6c75 7374 6572 5f73 6574 7300 0011 3e60 0300 6af7 0000 3287 0000 000c 0012 d00c 0012 d00c
2710100 0001 006e 0000 0000 0011 3eb8 0200 6aff 0000 3287 0000 0008 0013 7bd0 0013 7bd0 0001 006e 0000 0000 0011 3f2c 0300 6b07
2710160 0000 3287 0000 000c 0013 7a04 0013 7a04 0001 006e 0000 0000 0011 3f80 0400 6b0f 0000 3287 0000 0010 0013 794c 0013 794c
2710240 0001 006e 0000 0000 27f0 0014 0012 d0a0 4e1c 0000 0000 0007 5548 228c 2cac 6a39 0002 438a 2ca0 6a25 0000 0000 0000 0001
2710320 0013 7938 0012 d0a0 0012 d0aa 0010 e2dc 0011 6765 6e65 7261 7465 5f63 6c75 7374 6572 7300 0011 3fdc 0400 6b17 0000 3287
2710400 0000 0010 0013 79a4 0013 79a4 0001 006e 0000 0000 2c78 0020 0002 438a 2520 47bc 3430 247c 0013 79d4 0014 37f0 3cf4 234c
2710460 0013 79f4 0011 401c 0400 6b1f 0000 3287 0000 0010 0013 7b1c 0013 7b1c 0001 006e 0000 0000 0011 404c 0200 6b27 0000 3287
2710540 0000 0008 0013 7ac4 0012 d1fc 0001 006e 0000 0000 2c78 0014 0002 438a 36b8 437c 239c 0000 0013 7a28 0013 78f8 0400 6b07
2710620 0000 3287 0000 0010 0013 7a4c 0013 7a4c 0001 006e 0000 0000 27f0 0014 0012 d174 4e1c 0000 0000 0007 49c8 228c 2cac 67e9
2710700 0002 438a 2ca0 67e9 0000 0000 0000 0001 0013 7a38 0012 d174 0012 d17e 0010 e3a8 0010 19e0 0400 504f 0000 3287 0000 0010
2710760 0013 7b60 0013 7ba8 0001 006e 0000 0000 0011 40d8 0100 6b37 0000 3287 0000 0004 000a 18f0 0002 438a 0003 006f 0000 0000
2711040 2938 0014 0012 d1fc 4e1c 0000 0000 0007 54a8 228c 27f0 2b37 0012 d1fc 2ca0 08af 0000 0000 0000 0001 0013 7ab0 0012 d1fc
2711120 0002 438a 0010 e4e4 0013 79e4 0300 6b27 0000 3287 0000 000c 0012 c53c 0012 d288 0001 006e 0000 0000 27f0 0014 0012 d314
2711200 4e1c 0000 0000 0007 5548 228c 2cac 0607 0002 438a 2ca0 7b19 0000 0000 0000 0001 0013 7b08 0013 7b40 000d 4c60 0010 e948
2711260 2954 0020 0002 438a 56f8 6580 0018 5ec0 0000 0018 0200 0ad7 5f8c 22bc 0013 79d4 27f0 0012 0013 7b74 4960 4d6c 0000 0003
2711340 2edc 7b42 28c4 0014 0013 7b88 2520 247c 000b 1524 000c 2eb0 28c4 0020 0013 7ba8 3724 0018 2520 3640 3614 0018 24d0 0000
```

| | | | | | | | | | | | | | | | | | | | | | | | | |
|---|---|---|---|---|---|---|---|---|---|---|---|---|---|---|---|---|---|---|---|---|---|---|---|---|
| 2711420 | 000b | 1524 | 000c | 2eb0 | 2954 | 0012 | 0002 | 438a | 4f18 | 0000 | 0000 | 5077 | 228c | 7bb1 | 27f0 | 0014 | 0013 | 7bf4 | 4e1c | 0000 | 0000 | 0007 | 54a8 | 228c |
| 2711500 | 2cac | 08af | 0002 | 438a | 2ca0 | 5c41 | 0000 | 0000 | 0000 | 0001 | 0013 | 7bbc | 0013 | 7bf4 | 0013 | 7bfe | 0010 | edc0 | 2954 | 0024 | 0002 | 438a | 56f8 | 62c0 |
| 2711560 | 5758 | 6464 | 5e54 | 0000 | 0200 | 0ad7 | 6bf4 | 6bf4 | 239c | 0000 | 0013 | 78e8 | 0011 | 3590 | 0100 | 5eef | 0000 | 3287 | 0000 | 0004 | 000a | 18f0 | 0002 | 438a |
| 2711640 | 0003 | 006f | 0000 | 0000 | 001a | 7072 | 6f63 | 626f | 6479 | 5f6f | 7065 | 7261 | 746f | 725f | 636c | 7573 | 7465 | 7273 | 0013 | 7c66 | 0012 | 7075 | 7464 | 625f |
| 2711720 | 636c | 7573 | 7465 | 725f | 7365 | 7473 | 0000 | 08af | 0011 | 411c | 0200 | 6b3f | 0000 | 3287 | 0000 | 0008 | 0013 | 39e0 | 0013 | 39e0 | 0001 | 006f | 0000 | 0000 |
| 2712000 | 0011 | 414c | 0200 | 6b47 | 0000 | 3287 | 0000 | 0008 | 000d | 4c0c | 0013 | 3a54 | 0001 | 006f | 0000 | 0000 | 0014 | 6465 | 7369 | 676e | 5f66 | 726f | 6d5f | 636c |
| 2712060 | 7573 | 7465 | 7273 | 0073 | 0011 | 2020 | 2020 | 2044 | 6573 | 6967 | 6e3a | 207e | 777e | 6e90 | 000b | af28 | 0200 | 6b4f | 0000 | 3287 | 0000 | 0008 | 0013 | 3adc |
| 2712140 | 0013 | 3adc | 0001 | 006f | 0000 | 0000 | 0011 | 417c | 0200 | 6b57 | 0000 | 3287 | 0000 | 0008 | 0013 | 8054 | 0013 | 8054 | 0001 | 006f | 0000 | 0000 | 0011 | 4cb8 |
| 2712220 | 0200 | 6b5f | 0000 | 3287 | 0000 | 0008 | 0013 | 3b40 | 0013 | 3b40 | 0001 | 006f | 0000 | 0000 | 000f | 6578 | 6973 | 7473 | 5f63 | 6c75 | 7374 | 6572 | 7300 | 08af |
| 2712300 | 0011 | 4384 | 0100 | 6b87 | 0000 | 3287 | 0000 | 0004 | 0013 | 3c8c | 0013 | 3c8c | 0001 | 006f | 0000 | 0000 | 0011 | 4264 | 0100 | 6b6f | 0000 | 3287 | 0000 | 0004 |
| 2712360 | 0013 | 7dc8 | 0013 | 7dc8 | 0001 | 006f | 0000 | 0000 | 0011 | 42a4 | 0100 | 6b77 | 0000 | 3287 | 0000 | 0004 | 0013 | 7db0 | 0013 | 7db0 | 0001 | 006f | 0000 | 0000 |
| 2712440 | 2c78 | 0018 | 0002 | 438a | 35c8 | 43c0 | 0100 | 5eef | 6b88 | 22bc | 0012 | 08d8 | 2c78 | 0018 | 0002 | 438a | 35c8 | 43c0 | 0100 | 6b37 | 6b88 | 22bc | 0012 | 08d8 |
| 2712520 | 0011 | 4364 | 0300 | 6b7f | 0000 | 3287 | 0000 | 000c | 000a | 18f0 | 0002 | 438a | 0003 | 006f | 0000 | 0000 | 0017 | 636f | 6470 | 7574 | 655f | 6469 | 7374 | 616e |
| 2712600 | 6365 | 5f6d | 6174 | 7269 | 7800 | 7e26 | 0013 | 7d50 | 0200 | 6b87 | 0000 | 3287 | 0000 | 0008 | 0013 | 7e3c | 0013 | 7e3c | 0001 | 006f | 0000 | 0000 | 2c78 | 0020 |
| 2712660 | 0002 | 438a | 2520 | 46d8 | 332c | 247c | 0010 | 3fc8 | 0014 | 3d30 | 2420 | 0000 | 0013 | 7e6c | 0011 | 63ec | 0200 | 6b8f | 0000 | 3287 | 0000 | 0008 | 000d | 4c30 |
| 2712740 | 0013 | 3d38 | 0001 | 006f | 0000 | 0000 | 0011 | 4430 | 0400 | 6b97 | 0000 | 3287 | 0000 | 0010 | 0013 | 3da0 | 0013 | 3da0 | 0001 | 006f | 0000 | 0000 | 0010 | 636f |
| 2713020 | 6d70 | 7574 | 655f | 6469 | 7374 | 616e | 6365 | 0033 | 000e | 7075 | 7464 | 625f | 6469 | 7374 | 616e | 6365 | 0013 | 7eb9 | 0011 | 4470 | 0400 | 6b9f | 0000 | 3287 |
| 2713100 | 0000 | 0010 | 0013 | 7f24 | 0011 | 3e30 | 0001 | 006f | 0000 | 0000 | 0011 | 44b4 | 0300 | 6ba7 | 0000 | 3287 | 0000 | 000c | 0013 | 3ea0 | 0013 | 3ea0 | 0001 | 006f |
| 2713160 | 000c | 0000 | 0011 | 4570 | 0500 | 6baf | 0000 | 3287 | 0000 | 0014 | 0013 | 8510 | 0013 | 8510 | 0001 | 0071 | 0000 | 0000 | 27f0 | 0a13 | 0011 | 3e30 | 2ca0 | 7f3e |
| 2713240 | 0000 | 0004 | 0000 | 0002 | 0013 | 3e08 | 0011 | 3e30 | 0002 | 438a | 000a | 3324 | 0011 | 45a0 | 0500 | 6bb7 | 0000 | 3287 | 0000 | 0014 | 0013 | 85f4 | 0013 | 85f4 |
| 2713320 | 0001 | 0071 | 0000 | 0000 | 000f | 6578 | 6973 | 7473 | 5f64 | 6973 | 7461 | 6e63 | 6500 | 08af | 0011 | 45c0 | 0300 | 6bbf | 0000 | 3287 | 0000 | 000c | 0013 | 7fa4 |
| 2713400 | 0013 | 7fa4 | 0001 | 006f | 0000 | 0000 | 000a | 2408 | 0000 | 0000 | 2c78 | 001c | 0002 | 438a | 3690 | 43c0 | 0300 | 6b7f | 6c08 | 6b88 | 6bc8 | 22bc | 0012 | 08d8 |
| 2713460 | 0015 | 6465 | 7369 | 676e | 735f | 6672 | 6f6d | 5f70 | 726f | 6362 | 6f64 | 7900 | 0011 | 45e0 | 0200 | 6bc7 | 0000 | 3287 | 0000 | 0008 | 0013 | 8008 | 0013 | 8008 |
| 2713540 | 0001 | 006f | 0000 | 0000 | 0011 | 2fd0 | 0000 | 0000 | 0003 | 6275 | 6400 | 2fd0 | 2c78 | 0018 | 0002 | 438a | 4268 | 0000 | 0000 | 6baf | 239c | 0000 | 0013 | 8030 |
| 2713620 | 0013 | 7fd8 | 0300 | 6bc7 | 0000 | 3287 | 0000 | 000c | 0013 | 3f98 | 0013 | 3f98 | 0001 | 006f | 0000 | 0000 | 27f0 | 0014 | 0013 | 8094 | 4e1c | 0000 | 0000 | 0007 |
| 2713700 | 54a8 | 228c | 2cac | 8062 | 0002 | 438a | 2ca0 | 0a13 | 0000 | 0000 | 0000 | 0001 | 0013 | 8040 | 0013 | 8094 | 0013 | 809e | 0011 | 214c | 0018 | 6465 | 7369 | 676e |
| 2713760 | 5f66 | 726f | 6d5f | 636c | 7573 | 7465 | 7273 | 5f61 | 7578 | 0023 | 2954 | 0024 | 0002 | 438a | 56f8 | 671c | 682c | 5758 | 6750 | 6a00 | 24d0 | 0000 | 0013 | 80c8 |
| 2714040 | 0014 | 2330 | 0013 | 740c | 0011 | 463c | 0200 | 6bcf | 0000 | 3287 | 0000 | 0008 | 0013 | 80ec | 0013 | 80ec | 0001 | 006f | 0000 | 0000 | 27f0 | 0014 | 0013 | 8110 |
| 2714120 | 4e1c | 0000 | 0000 | 0007 | 54a8 | 228c | 2cac | 80e5 | 0002 | 438a | 2ca0 | 08af | 0000 | 0000 | 0000 | 0001 | 0013 | 80d8 | 0013 | 8110 | 0013 | 811a | 0011 | 25b4 |
| 2714200 | 2954 | 0024 | 0002 | 438a | 56f8 | 671c | 682c | 5758 | 6750 | 6a00 | 24d0 | 0000 | 000b | 4eb4 | 0014 | 2330 | 0013 | 80c8 | 0012 | 636f | 6d6d | 6f6e | 5f63 | 6f6e |
| 2714260 | 6e65 | 6374 | 696f | 6e73 | 0013 | 8156 | 0016 | 636f | 6d6d | 6f6e | 5f63 | 6f6e | 6e65 | 6374 | 696f | 6e73 | 5f61 | 7578 | 0013 | 815d | 0011 | 465c | 0300 | 6bd7 |
| 2714340 | 0000 | 3287 | 0000 | 000c | 0013 | 40d8 | 0013 | 40d8 | 0001 | 006f | 0000 | 0000 | 0011 | 469c | 0300 | 6bdf | 0000 | 3287 | 0000 | 000c | 0013 | 4198 | 0013 | 4198 |
| 2714420 | 0001 | 006f | 0000 | 0000 | 0011 | 746f | 7461 | 6c5f | 636f | 6e6e | 6563 | 7469 | 6f6e | 7300 | 0011 | 46e0 | 0300 | 6be7 | 0000 | 3287 | 0000 | 000c | 0013 | 81dc |
| 2714500 | 0013 | 81dc | 0001 | 006f | 0000 | 0000 | 2c78 | 0024 | 0002 | 438a | 2520 | 4740 | 344c | 33d8 | 24d0 | 0000 | 0013 | 8210 | 0018 | aa50 | aa34 | 9d88 | af34 | 723c |
| 2714560 | 0013 | 81bc | 0400 | 6be7 | 0000 | 3287 | 0000 | 0010 | 0013 | 4290 | 0013 | 4290 | 0001 | 006f | 0000 | 0000 | 0015 | 746f | 7461 | 6c5f | 636f | 6e6e | 6563 | 7469 |
| 2714640 | 6f6e | 735f | 6175 | 7800 | 0011 | 4700 | 0400 | 6bef | 0000 | 3287 | 0000 | 0010 | 0013 | 435c | 0013 | 435c | 0001 | 006f | 0000 | 0000 | 001c | 6f70 | 6572 | 6174 |
| 2714720 | 6f72 | 5f63 | 6c75 | 7374 | 6572 | 5f63 | 6f6e | 6e65 | 6374 | 696f | 6e73 | 0073 | 0020 | 6f70 | 6572 | 6174 | 6f72 | 5f63 | 6c75 | 7374 | 6572 | 5f63 | 6f6e | 6e65 |
| 2715000 | 6374 | 696f | 6e73 | 5f61 | 7578 | 0023 | 0011 | 4740 | 0500 | 6bf7 | 0000 | 3287 | 0000 | 0014 | 0013 | 4434 | 0013 | 4434 | 0001 | 006f | 0000 | 0000 | 0011 | 47cc |
| 2715060 | 0500 | 6bff | 0000 | 3287 | 0000 | 0014 | 0013 | 450c | 0013 | 450c | 0001 | 006f | 0000 | 0000 | 0012 | 636c | 7573 | 7465 | 725f | 7375 | 7070 | 6f72 | 742e | 706c |
| 2715140 | 0008 | af5d | 0013 | 8484 | 0000 | 002c | b288 | b66c | 0000 | 036a | 7fff | ffff | 0013 | a720 | 0200 | 0db5 | 0100 | 15ad | 0100 | 33fd | 0000 | 000b | 0000 | 315f |
| 2715220 | 0036 | 2f68 | 6f6d | 652f | 6f73 | 6173 | 312f | 612f | 7669 | 6a61 | 792f | 5648 | 444c | 2f70 | 6172 | 7365 | 722f | 7072 | 6f6c | 6f67 | 2f6e | 6577 | 6e65 | 772f |
| 2715300 | 7633 | 2e31 | 2f62 | 7564 | 0020 | 6675 | 0039 | 2f68 | 6f6d | 652f | 6f73 | 6173 | 312f | 612f | 7669 | 6a61 | 792f | 5648 | 444c | 2f70 | 6172 | 7365 | 722f | 7072 |
| 2715360 | 6f6c | 6f67 | 2f6e | 6577 | 6e65 | 772f | 7633 | 2e31 | 2f62 | 7564 | 2e70 | 6c00 | 0039 | 2f68 | 6f6d | 652f | 6f73 | 6173 | 312f | 612f | 7669 | 6a61 | 792f | 5648 |
| 2715440 | 444c | 2f70 | 6172 | 7365 | 722f | 7072 | 6f6c | 6f67 | 2f6e | 6577 | 6e65 | 772f | 7633 | 2e31 | 2f61 | 7061 | 7274 | 7900 | 003c | 2f68 | 6f6d | 652f | 6f73 | 6173 |
| 2715520 | 312f | 612f | 7669 | 6a61 | 792f | 5648 | 444c | 2f70 | 6172 | 7365 | 722f | 7072 | 6f6c | 6f67 | 2f6e | 6577 | 6e65 | 772f | 7633 | 2e31 | 2f61 | 7061 | 7274 | 792e |
| 2715600 | 706c | 0020 | 0000 | 002c | 0013 | a720 | b27c | b66c | 0000 | 016d | 7fff | ffff | 0013 | 5884 | 0200 | 0db5 | 0200 | 2f35 | 0000 | 6c3f | 0000 | 038b | 0000 | 315f |
| 2715660 | 0000 | 002c | 0013 | a74c | b27c | b66c | 0000 | 0d7a | 7fff | ffff | 0013 | 58b0 | 0200 | 0db5 | 0200 | 224d | 0000 | 6c3f | 0000 | 3287 | 0000 | 315f | 000e | 6461 |
| 2715740 | 7461 | 5f70 | 726f | 7869 | 6d69 | 7479 | 0000 | 0000 | 0013 | 85c0 | 0000 | 0090 | b27c | b66c | 0000 | 0d6f | 0000 | 0d79 | 000a | d16d | 0200 | 0db5 | 0200 | 270d |
| 2716020 | 0000 | 6c3f | 0000 | 3287 | 0000 | 315f | 0013 | 84e8 | 0000 | 0038 | b27c | b66c | 0000 | 0d70 | 0000 | 0d7b | 0013 | 85c4 | 0200 | 0db5 | 0500 | 1cdd | 0000 | 6baf |
| 2716100 | 0000 | 002b | 0000 | 3287 | C09b | f8a3 | 0000 | C39b | 0000 | 315f | 0013 | 85c0 | 0000 | 002c | b4f0 | b4e4 | 0000 | 0d6f | 7fff | ffff | 0008 | b0dd | 0000 | 0000 |
| 2716160 | 0000 | 0000 | 0013 | 88d8 | 0002 | 438a | 000b | 5218 | 2c78 | 00aa | 0002 | 438a | 45e8 | 0020 | 4728 | 0024 | 4790 | 0030 | 47e4 | 4810 | 0018 | 3410 | 0028 | 382c |
| 2716240 | 0024 | 3c9c | 0000 | 0020 | 0013 | e768 | 0034 | 3410 | 002c | 382c | 0024 | 3c9c | 0000 | 0020 | 0013 | e788 | 0034 | aa88 | 0030 | aa88 | 002c | 9de0 | ac08 | aa88 |
| 2716320 | 0028 | a858 | 9d88 | abb8 | 3586 | 37b0 | 9d88 | ada8 | 2e7c | ae74 | 001c | 2ba0 | 0028 | 002c | 382c | 0024 | 3af4 | 0020 | 0013 | e7a8 | 0020 | aa88 | 001c | 2e98 |
| 2716400 | 33d8 | 3818 | 4300 | 0000 | 0000 | 0013 | 000f | 53b0 | 0018 | 2c88 | 000c | 2c58 | 32b8 | 4c70 | 0000 | 000b | aa50 | aa34 | 9e0c | af34 | 723c | 7261 | 0013 | 86a4 |
| 2716460 | 0000 | 0038 | b27c | b66c | 0000 | 0d71 | 0000 | 0d7c | 0013 | 86a8 | 0200 | 0db5 | 0500 | 1cdd | 0000 | 6bb7 | 0000 | 002b | 0000 | 3287 | 009b | fac3 | 0000 | 038b |

| | | | | | | | | | | | | | | | | | | | | | | | | |
|---|---|---|---|---|---|---|---|---|---|---|---|---|---|---|---|---|---|---|---|---|---|---|---|---|
| 2716540 | 0000 | 315f | 2c78 | 00aa | 0002 | 438a | 45e8 | 0020 | 4728 | 0024 | 4790 | 0030 | 47e4 | 4810 | 0018 | 3410 | 0028 | 382c | 0024 | 3c9c | 0000 | 0020 | 0013 | e768 |
| 2716620 | 0034 | 3410 | 002c | 382c | 0024 | 3c9c | 0000 | 0020 | 0013 | e788 | 0034 | aa88 | 0030 | aa88 | 002c | 9de0 | ac08 | aa88 | 0028 | a858 | 9d88 | abb8 | 3586 | 37b0 |
| 2716700 | 9d88 | ada8 | 2e7c | ae74 | 001c | 2ba0 | 0028 | 002c | 382c | 0024 | 3af4 | 0020 | 0013 | e7ec | 0020 | aa88 | 001c | 2e98 | 33d8 | 3818 | 4300 | 0000 | 0000 | 0013 |
| 2716760 | 000f | 53b0 | 0018 | 2c88 | 000c | 2c58 | 32b8 | 4c70 | 0000 | 000b | aa50 | aa34 | 9e0c | af34 | 723c | 696d | 0013 | 8728 | 0000 | 0038 | b27c | b66c | 0000 | 0d72 |
| 2717040 | 0000 | 0d7d | 0013 | 872c | 0200 | 0db5 | 0500 | 1cdd | 0000 | 6c57 | 0000 | 001b | 0000 | 3287 | 009f | 3b43 | 0000 | 038b | 0000 | 315f | 2c78 | 004c | 0002 | 438a |
| 2717120 | 45e8 | 001c | 4728 | 0020 | 4740 | 3364 | 3af4 | 001c | 0013 | a32c | 0024 | 3348 | 3af4 | 0020 | 0013 | a32c | 0024 | 33bc | 382c | 0020 | 3af4 | 001c | 0013 | a30c |
| 2717200 | 001c | aa6c | aa50 | 9d88 | aa34 | 9db0 | aa34 | 9e0c | af34 | 723c | 0013 | 8794 | 0000 | 0038 | b27c | b66c | 0000 | 0d73 | 0000 | 0d7e | 0013 | 8798 | 0200 | 0db5 |
| 2717260 | 0500 | 1cdd | 0000 | 6c77 | 0000 | 001b | 0000 | 3287 | 009f | 4163 | 0000 | 038b | 0000 | 315f | 2c78 | 0034 | 0002 | 438a | 2520 | 4740 | 33bc | 247c | 0013 | e768 |
| 2717340 | 0014 | aa34 | abe0 | 0000 | 3586 | 37b0 | 9d88 | ac08 | abe0 | 0000 | 3f80 | 0000 | a858 | 9e0c | af34 | 723c | 0013 | 8800 | 0000 | 0038 | b27c | b66c | 0000 | 0d74 |
| 2717420 | 0000 | 0d7f | 0013 | 8804 | 0200 | 0db5 | 0500 | 1cdd | 0000 | 6c5f | 0000 | 001b | 0000 | 3287 | 009f | 3c43 | 0000 | 038b | 0000 | 315f | 2c78 | 0032 | 0002 | 438a |
| 2717500 | 2520 | 4740 | 34e0 | 0018 | 3468 | 33f4 | 24d0 | 0000 | 0013 | 82ac | 001c | aa6c | aa50 | 9d88 | ac08 | aa34 | a858 | 9e0c | af34 | 2ecc | 723c | 6174 | 0013 | 886c |
| 2717560 | 0000 | 0038 | b27c | b66c | 0000 | 0d75 | 0000 | 0d80 | 0013 | 8870 | 0200 | 0db5 | 0500 | 1cdd | 0000 | 6c7f | 0000 | 001b | 0000 | 3287 | 009f | 43a3 | 0000 | 038b |
| 2717640 | 0000 | 315f | 2c78 | 0034 | 0002 | 438a | 2520 | 4740 | 33bc | 247c | 0013 | e788 | 0014 | aa34 | abe0 | 0000 | 3586 | 37b0 | 9d88 | ac08 | abe0 | 0000 | 3f80 | 0000 |
| 2717720 | a858 | 9e0c | af34 | 723c | 0013 | 88d4 | 0000 | 0038 | b27c | b66c | 0000 | 0d76 | 0000 | 0d81 | 0013 | 88d8 | 0200 | 0db5 | 0500 | 1cdd | 0000 | 6c6f | 0000 | 0013 |
| 2720000 | 0000 | 3287 | 009f | 3f63 | 0000 | 038b | 0000 | 315f | 2c78 | 0030 | 0002 | 438a | 2520 | 4700 | 3228 | 3310 | 24d0 | 0000 | 0012 | f02c | 0018 | 3228 | 332c | 3a4c |
| 2720060 | 0012 | f02c | 0014 | 2ecc | 3d00 | 4a7c | 000c | 723c | 0013 | 8964 | 0000 | 0038 | b130 | b66c | 0000 | 0d77 | 0000 | 0d82 | 0013 | 84ed | 0200 | 0db5 | 0500 | 1cdd |
| 2720140 | 0000 | 6c67 | 0000 | 0013 | 0000 | 3287 | 009f | 3d43 | 0000 | 038b | 0000 | 315f | 2c78 | 0058 | 0002 | 438a | 45dc | 4728 | 001c | 3818 | 329c | 247c | 000b | 09b0 |
| 2720220 | 0020 | 382c | 001c | 32b8 | 24d0 | 0000 | 000b | 09b0 | 0020 | 382c | 001c | 37b0 | 8d94 | aab4 | 0000 | a260 | 2e7c | ad64 | 2ba0 | 0018 | 0014 | 3d3c | 40e0 | 0000 |
| 2720300 | 000b | 798c | 0010 | aa18 | 2e98 | c5a8 | 2c58 | 723c | 0013 | a788 | 0000 | 199c | 0a66 | 636f | 7374 | 285b | 2a2c | 2b2c | 2d5d | 2c32 | 3239 | 3129 | 2e0a | 6663 |
| 2720360 | 6f73 | 7428 | 5b2a | 2c2b | 2c2f | 5d2c | 3232 | 3539 | 292e | 0a66 | 636f | 7374 | 285b | 2a2c | 2b2c | 3c5d | 2c32 | 3432 | 3129 | 2e0a | 6663 | 6f73 | 7428 | 5b2a |
| 2720440 | 2c2d | 2c2f | 5d2c | 3232 | 3931 | 292e | 0a66 | 636f | 7374 | 285b | 2a2c | 2d2c | 3c5d | 2c32 | 3435 | 3329 | 2e0a | 6663 | 6f73 | 7428 | 5b2a | 2c2f | 2c3c | 5d2c |
| 2720520 | 3232 | 3631 | 292e | 0a66 | 636f | 7374 | 285b | 2b2c | 2d2c | 2f5d | 2c32 | 3239 | 3129 | 2e0a | 6663 | 6f73 | 7428 | 5b2b | 2c2d | 2c3c | 5d2c | 3335 | 3429 | 2e0a |
| 2720600 | 6663 | 6f73 | 7428 | 5b2b | 2c2f | 2c3c | 5d2c | 3234 | 3231 | 292e | 0a66 | 636f | 7374 | 285b | 2d2c | 2f2c | 3c5d | 2c32 | 3435 | 3329 | 2e0a | 0a66 | 636f | 7374 |
| 2720660 | 285b | 2a2c | 2b2c | 2d2c | 2f5d | 2c32 | 3239 | 3129 | 2e0a | 6663 | 6f73 | 7428 | 5b2a | 2c2b | 2c2d | 2c3c | 5d2c | 3234 | 3533 | 292e | 0a66 | 636f | 7374 | 285b |
| 2720740 | 2a2c | 2b2c | 2f2c | 3c5d | 2c32 | 3432 | 3129 | 2e0a | 6663 | 6f73 | 7428 | 5b2a | 2c2d | 2c2f | 2c3c | 5d2c | 3234 | 3533 | 292e | 0a66 | 636f | 7374 | 285b | 2b2c |
| 2721020 | 2d2c | 2f2c | 3c5d | 2c32 | 3435 | 3329 | 2e0a | 0a66 | 636f | 7374 | 285b | 2a2c | 2b2c | 2d2c | 2f2c | 3c5d | 2c32 | 3435 | 3329 | 2e0a | 0000 | 0013 | 0200 | 0b3f |
| 2721100 | 0000 | 000f | 0000 | 0013 | 0100 | 231f | 0013 | 8acd | 0200 | 08af | 0000 | 0257 | 0013 | 8aed | 0100 | 3077 | 0000 | 0013 | 0200 | 08af | 0000 | 00cf | 0013 | 8b01 |
| 2721160 | 0100 | 1ff7 | 0000 | 037b | 0200 | 08af | 0000 | 009f | 0013 | 8b15 | 0100 | 3077 | 0000 | 000b | 0200 | 0b3f | 0000 | 2c47 | 0000 | 000b | 0200 | 0b3f | 0000 | 000f |
| 2721240 | 0000 | 0013 | 0100 | 231f | 0013 | 8b29 | 0200 | 08af | 0000 | 0257 | 0013 | 8b49 | 0100 | 3077 | 0000 | 000b | 0200 | 08af | 0000 | 00cf | 0013 | 8b5d | 0100 | 1ff7 |
| 2721320 | 0000 | 031b | 0200 | 08af | 0000 | 009f | 0013 | 8b71 | 0100 | 3077 | 0000 | 0013 | 0200 | 0b3f | 0000 | 2c47 | 0000 | 0013 | 0200 | 0b3f | 0000 | 000f | 0000 | 0013 |
| 2721400 | 0100 | 231f | 0013 | 8b85 | 0200 | 08af | 0000 | 0257 | 0013 | 8ba5 | 0100 | 3077 | 0000 | 0013 | 0200 | 08af | 0000 | 00cf | 0013 | 8bb9 | 0100 | 1ff7 | 0000 | 0103 |
| 2721460 | 0200 | 08af | 0000 | 009f | 0013 | 8bcd | 0100 | 3077 | 0000 | 030b | 0200 | 0b3f | 0000 | 2c47 | 0000 | 000b | 0200 | 0b3f | 0000 | 000f | 0000 | 0013 | 0100 | 231f |
| 2721540 | 0013 | 8be1 | 0200 | 08af | 0000 | 0257 | 0013 | 8c01 | 0100 | 3077 | 0000 | 000b | 0200 | 08af | 0000 | 00cf | 0013 | 8c15 | 0100 | 1ff7 | 0000 | 030b | 0200 | 08af |
| 2721620 | 0000 | 009f | 0013 | 8c29 | 0100 | 3077 | 0000 | 0013 | 0200 | 0b3f | 0000 | 2c47 | 0000 | 0013 | 0200 | 0b3f | 0000 | 000f | 0000 | 0013 | 0100 | 231f | 0013 | 8c3d |
| 2721700 | 0200 | 08af | 0000 | 0257 | 0013 | 8c5d | 0100 | 3077 | 0000 | 0013 | 0200 | 08af | 0000 | 00cf | 0013 | 8c71 | 0100 | 1ff7 | 0000 | 0103 | 0200 | 08af | 0000 | 009f |
| 2721760 | 0013 | 8c85 | 0100 | 3077 | 0000 | 000b | 0200 | 0b3f | 0000 | 2c47 | 0000 | 000b | 0200 | 0b3f | 0000 | 000f | 0000 | 0013 | 0100 | 231f | 0013 | 8c99 | 0200 | 08af |
| 2722040 | 0000 | 0257 | 0013 | 8cb9 | 0100 | 3077 | 0000 | 000b | 0200 | 08af | 0000 | 00cf | 0013 | 8ccd | 0100 | 1ff7 | 0000 | 0323 | 0200 | 08af | 0000 | 009f | 0013 | 8ce1 |
| 2722120 | 0100 | 3077 | 0000 | 0013 | 0200 | 0b3f | 0000 | 2c47 | 0000 | 0013 | 0200 | 0b3f | 0000 | 000f | 0000 | 0013 | 0100 | 231f | 0013 | 8cf5 | 0200 | 08af | 0000 | 0257 |
| 2722200 | 0013 | 8d15 | 0100 | 3077 | 0000 | 0013 | 0200 | 08af | 0000 | 00cf | 0013 | 8d29 | 0100 | 1ff7 | 0000 | 0373 | 0200 | 08af | 0000 | 009f | 0013 | 8d3d | 0100 | 3077 |
| 2722260 | 0000 | 000b | 0200 | 0b3f | 0000 | 2c47 | 0000 | 000b | 0200 | 0b3f | 0000 | 000f | 0000 | 0013 | 0100 | 231f | 0013 | 8d51 | 0200 | 08af | 0000 | 0257 | 0013 | 8d71 |
| 2722340 | 0100 | 3077 | 0000 | 000b | 0200 | 08af | 0000 | 00cf | 0013 | 8d85 | 0100 | 1ff7 | 0000 | 030b | 0200 | 08af | 0000 | 009f | 0013 | 8d99 | 0100 | 3077 | 0000 | 0013 |
| 2722420 | 0200 | 0b3f | 0000 | 2c47 | 0000 | 0013 | 0200 | 0b3f | 0000 | 000f | 0000 | 0013 | 0100 | 231f | 0013 | 8dad | 0200 | 08af | 0000 | 0257 | 0013 | 8dcd | 0100 | 3077 |
| 2722500 | 0000 | 0013 | 0200 | 08af | 0000 | 00cf | 0013 | 8de1 | 0100 | 1ff7 | 0000 | 0103 | 0200 | 08af | 0000 | 009f | 0013 | 8df5 | 0100 | 3077 | 0000 | 000b | 0200 | 0b3f |
| 2722560 | 0000 | 2c47 | 0000 | 000b | 0200 | 0b3f | 0000 | 000f | 0000 | 0013 | 0100 | 231f | 0013 | 8e09 | 0200 | 08af | 0000 | 0257 | 0013 | 8e29 | 0100 | 3077 | 0000 | 000b |
| 2722640 | 0200 | 08af | 0000 | 00cf | 0013 | 8e3d | 0100 | 1ff7 | 0000 | 039b | 0200 | 08af | 0000 | 009f | 0013 | 8e51 | 0100 | 3077 | 0000 | 0013 | 0200 | 0b3f | 0000 | 2c47 |
| 2722720 | 0000 | 0013 | 0200 | 0b3f | 0000 | 000f | 0000 | 0013 | 0100 | 231f | 0013 | 8e65 | 0200 | 08af | 0000 | 0257 | 0013 | 8e85 | 0100 | 3077 | 0000 | 0013 | 0200 | 08af |
| 2723000 | 0000 | 00cf | 0013 | 8e99 | 0100 | 1ff7 | 0000 | 032b | 0200 | 08af | 0000 | 009f | 0013 | 8ead | 0100 | 3077 | 0000 | 000b | 0200 | 0b3f | 0000 | 2c47 | 0000 | 000b |
| 2723060 | 0200 | 0b3f | 0000 | 000f | 0000 | 0013 | 0100 | 231f | 0013 | 8ec1 | 0200 | 08af | 0000 | 0257 | 0013 | 8ee1 | 0100 | 3077 | 0000 | 000b | 0200 | 08af | 0000 | 00cf |
| 2723140 | 0013 | 8ef5 | 0100 | 1ff7 | 0000 | 036b | 0200 | 08af | 0000 | 009f | 0013 | 8f09 | 0100 | 3077 | 0000 | 0013 | 0200 | 0b3f | 0000 | 2c47 | 0000 | 0013 | 0200 | 0b3f |
| 2723220 | 0000 | 000f | 0000 | 0013 | 0100 | 231f | 0013 | 8f1d | 0200 | 08af | 0000 | 0257 | 0013 | 8f3d | 0100 | 3077 | 0000 | 0013 | 0200 | 08af | 0000 | 00cf | 0013 | 8f51 |
| 2723300 | 0100 | 1ff7 | 0000 | 030b | 0200 | 08af | 0000 | 009f | 0013 | 8f65 | 0100 | 3077 | 0000 | 000b | 0200 | 0b3f | 0000 | 2c47 | 0000 | 000b | 0200 | 0b3f | 0000 | 000f |
| 2723360 | 0000 | 0013 | 0100 | 231f | 0013 | 8f79 | 0200 | 08af | 0000 | 0257 | 0013 | 8f99 | 0100 | 3077 | 0000 | 000b | 0200 | 08af | 0000 | 00cf | 0013 | 8fad | 0100 | 1ff7 |
| 2723440 | 0000 | 0373 | 0200 | 08af | 0000 | 009f | 0013 | 8fc1 | 0100 | 3077 | 0000 | 0013 | 0200 | 0b3f | 0000 | 2c47 | 0000 | 0013 | 0200 | 0b3f | 0000 | 000f | 0000 | 0013 |
| 2723520 | 0100 | 231f | 0013 | 8fd5 | 0200 | 08af | 0000 | 0257 | 0013 | 8ff5 | 0100 | 3077 | 0000 | 0013 | 0200 | 08af | 0000 | 00cf | 0013 | 9009 | 0100 | 1ff7 | 0000 | 0103 |
| 2723600 | 0200 | 08af | 0000 | 009f | 0013 | 901d | 0100 | 3077 | 0000 | 000b | 0200 | 0b3f | 0000 | 2c47 | 0000 | 000b | 0200 | 0b3f | 0000 | 000f | 0000 | 0013 | 0100 | 231f |

```
2723660  0013 9031 0200 08af 0000 0257 0013 9051 0100 3077 0000 000b 0200 08af 0000 00cf 0013 9065 0100 1ff7 0000 037b 0200 08af
2723740  0000 009f 0013 9079 0100 3077 0000 0013 0200 0b3f 0000 2c47 0000 0013 0200 0b3f 0000 000f 0000 0013 0100 231f 0013 908d
2724020  0200 08af 0000 0257 0013 90ad 0100 3077 0000 0013 0200 08af 0000 00cf 0013 90c1 0100 1ff7 0000 03bb 0200 08af 0000 009f
2724100  0013 90d5 0100 3077 0000 000b 0200 0b3f 0000 2c47 0000 000b 0200 0b3f 0000 000f 0000 0013 0100 231f 0013 90e9 0200 08af
2724160  0000 0257 0013 9109 0100 3077 0000 000b 0200 08af 0000 00cf 0013 911d 0100 1ff7 0000 03a3 0200 08af 0000 009f 0013 9131
2724240  0100 3077 0000 0013 0200 0b3f 0000 2c47 0000 0013 0200 0b3f 0000 000f 0000 0013 0100 231f 0013 9145 0200 08af 0000 0257
2724320  0013 9165 0100 3077 0000 0013 0200 08af 0000 00cf 0013 9179 0100 1ff7 0000 0103 0200 08af 0000 009f 0013 918d 0100 3077
2724400  0000 000b 0200 0b3f 0000 2c47 0000 000b 0200 0b3f 0000 000f 0000 0013 0100 231f 0013 91a1 0200 08af 0000 0257 0013 91c1
2724460  0100 3077 0000 000b 0200 08af 0000 00cf 0013 91d5 0100 1ff7 0000 0343 0200 08af 0000 009f 0013 91e9 0100 3077 0000 0013
2724540  0200 0b3f 0000 2c47 0000 0013 0200 0b3f 0000 000f 0000 0013 0100 231f 0013 91fd 0200 08af 0000 0257 0013 921d 0100 3077
2724620  0000 0013 0200 08af 0000 00cf 0013 9231 0100 1ff7 0000 03a3 0200 08af 0000 009f 0013 9245 0100 3077 0000 000b 0200 0b3f
2724700  0000 2c47 0000 000b 0200 0b3f 0000 000f 0000 0013 0100 231f 0013 9259 0200 08af 0000 0257 0013 9279 0100 3077 0000 000b
2724760  0200 08af 0000 00cf 0013 928d 0100 1ff7 0000 034b 0200 08af 0000 009f 0013 92a1 0100 3077 0000 0013 0200 0b3f 0000 2c47
2725040  0000 0013 0200 0b3f 0000 000f 0000 0013 0100 231f 0013 92b5 0200 08af 0000 0257 0013 92d5 0100 3077 0000 0013 0200 08af
2725120  0000 00cf 0013 92e9 0100 1ff7 0000 03bb 0200 08af 0000 009f 0013 92fd 0100 3077 0000 000b 0200 0b3f 0000 2c47 0000 000b
2725200  0200 0b3f 0000 000f 0000 0013 0100 231f 0013 9311 0200 08af 0000 0257 0013 9331 0100 3077 0000 000b 0200 08af 0000 00cf
2725260  0013 9345 0100 1ff7 0000 0103 0200 08af 0000 009f 0013 9359 0100 3077 0000 0013 0200 0b3f 0000 2c47 0000 0013 0200 0b3f
2725340  0000 000f 0000 0013 0100 231f 0013 936d 0200 08af 0000 0257 0013 938d 0100 3077 0000 0013 0200 08af 0000 00cf 0013 93a1
2725420  0100 1ff7 0000 0373 0200 08af 0000 009f 0013 93b5 0100 3077 0000 000b 0200 0b3f 0000 2c47 0000 000b 0200 0b3f 0000 000f
2725500  0000 0013 0100 231f 0013 93c9 0200 08af 0000 0257 0013 93e9 0100 3077 0000 000b 0200 08af 0000 00cf 0013 93fd 0100 1ff7
2725560  0000 037b 0200 08af 0000 009f 0013 9411 0100 3077 0000 0013 0200 0b3f 0000 2c47 0000 0013 0200 0b3f 0000 000f 0000 0013
2725640  0100 231f 0013 9425 0200 08af 0000 0257 0013 9445 0100 3077 0000 0013 0200 08af 0000 00cf 0013 9459 0100 1ff7 0000 034b
2725720  0200 08af 0000 009f 0013 946d 0100 3077 0000 000b 0200 0b3f 0000 2c47 0000 000b 0200 0b3f 0000 000f 0000 0013 0100 231f
2726000  0013 9481 0200 08af 0000 0257 0013 94a1 0100 3077 0000 000b 0200 08af 0000 00cf 0013 94b5 0100 1ff7 0000 03a3 0200 08af
2726060  0000 009f 0013 94c9 0100 3077 0000 0013 0200 0b3f 0000 2c47 0000 0013 0200 0b3f 0000 000f 0000 0013 0100 231f 0013 94dd
2726140  0200 08af 0000 0257 0013 94fd 0100 3077 0000 0013 0200 08af 0000 00cf 0013 9511 0100 1ff7 0000 030b 0200 08af 0000 009f
2726220  0013 9525 0100 3077 0000 000b 0200 0b3f 0000 2c47 0000 000b 0200 0b3f 0000 000f 0000 0013 0100 231f 0013 9539 0200 08af
2726300  0000 0257 0013 9559 0100 3077 0000 000b 0200 08af 0000 00cf 0013 956d 0100 1ff7 0000 031b 0200 08af 0000 009f 0013 9581
2726360  0100 3077 0000 0013 0200 0b3f 0000 2c47 0000 0013 0200 0b3f 0000 000f 0000 0013 0100 231f 0013 9595 0200 08af 0000 0257
2726440  0013 95b5 0100 3077 0000 0013 0200 08af 0000 00cf 0013 95c9 0100 1ff7 0000 034b 0200 08af 0000 009f 0013 95dd 0100 3077
2726520  0000 000b 0200 0b3f 0000 2c47 0000 000b 0200 0b3f 0000 000f 0000 0013 0100 231f 0013 95f1 0200 08af 0000 0257 0013 9611
2726600  0100 3077 0000 000b 0200 08af 0000 00cf 0013 9625 0100 1ff7 0000 0323 0200 08af 0000 009f 0013 9639 0100 3077 0000 0013
2726660  0200 0b3f 0000 2c47 0000 0013 0200 0b3f 0000 000f 0000 0013 0100 231f 0013 964d 0200 08af 0000 0257 0013 966d 0100 3077
2726740  0000 0013 0200 08af 0000 00cf 0013 9681 0100 1ff7 0000 0373 0200 08af 0000 009f 0013 9695 0100 3077 0000 000b 0200 0b3f
2727020  0000 2c47 0000 000b 0200 0b3f 0000 000f 0000 0013 0100 231f 0013 96a9 0200 08af 0000 0257 0013 96c9 0100 3077 0000 000b
2727100  0200 08af 0000 00cf 0013 96dd 0100 1ff7 0000 034b 0200 08af 0000 009f 0013 96f1 0100 3077 0000 0013 0200 0b3f 0000 2c47
2727160  0000 0013 0200 0b3f 0000 000f 0000 0013 0100 231f 0013 9705 0200 08af 0000 0257 0013 9725 0100 3077 0000 0013 0200 08af
2727240  0000 00cf 0013 9739 0100 1ff7 0000 02fb 0200 08af 0000 009f 0013 974d 0100 3077 0000 000b 0200 0b3f 0000 2c47 0000 000b
2727320  0200 0b3f 0000 000f 0000 0013 0100 231f 0013 9761 0200 08af 0000 0257 0013 9781 0100 3077 0000 000b 0200 08af 0000 00cf
2727400  0013 9795 0100 1ff7 0000 032b 0200 08af 0000 009f 0013 97a9 0100 3077 0000 0013 0200 0b3f 0000 2c47 0000 0013 0200 0b3f
2727460  0000 000f 0000 0013 0100 231f 0013 97bd 0200 08af 0000 0257 0013 97dd 0100 3077 0000 0013 0200 08af 0000 00cf 0013 97f1
2727540  0100 1ff7 0000 0383 0200 08af 0000 009f 0013 9805 0100 3077 0000 000b 0200 0b3f 0000 2c47 0000 000b 0200 0b3f 0000 000f
2727620  0000 0013 0100 231f 0013 9819 0200 08af 0000 0257 0013 9839 0100 3077 0000 000b 0200 08af 0000 00cf 0013 984d 0100 1ff7
2727700  0000 03cb 0200 08af 0000 009f 0013 9861 0100 3077 0000 0013 0200 0b3f 0000 2c47 0000 0013 0200 0b3f 0000 000f 0000 0013
2727760  0100 231f 0013 9875 0200 08af 0000 0257 0013 9895 0100 3077 0000 0013 0200 08af 0000 00cf 0013 98a9 0100 1ff7 0000 03a3
2730040  0200 08af 0000 009f 0013 98bd 0100 3077 0000 000b 0200 0b3f 0000 2c47 0000 000b 0200 0b3f 0000 000f 0000 0013 0100 231f
2730120  0013 98d1 0200 08af 0000 0257 0013 98f1 0100 3077 0000 000b 0200 08af 0000 00cf 0013 9905 0100 1ff7 0000 0313 0200 08af
2730200  0000 009f 0013 9919 0100 3077 0000 0013 0200 0b3f 0000 2c47 0000 0013 0200 0b3f 0000 000f 0000 0013 0100 231f 0013 992d
2730260  0200 08af 0000 0257 0013 9941 0100 3077 0000 0013 0200 08af 0000 00cf 0013 9961 0100 1ff7 0000 03ab 0200 08af 0000 009f
2730340  0013 9975 0100 3077 0000 000b 0200 08af 0000 0257 0013 9989 0100 3077 0000 000b 0200 08af 0000 00cf 0013 999d 0100 1ff7
2730420  0000 039b 0200 08af 0000 009f 0013 99b1 0100 3077 0000 0013 0013 7f8d 0000 0007 0013 99c9 0000 0007 0200 08af 0000 060f
2730500  0012 ec11 0013 99c9 0000 0007 0013 99c9 0000 0007 0013 99c9 0000 0007 0013 99a5 0013 99e6 0013 9991 0013 99ee 0013 997d
2730560  0013 99f6 0013 997d 0013 99f6 0013 997d 0013 99f6 0013 9969 0013 9a0e 0013 9955 0013 9a16 0013 9941 0013 9a1e 0013 9941
2730640  0013 9a1e 0013 9941 0013 9a1e 0013 990d 0013 9a36 0013 98f9 0013 9a3e 0013 98e5 0013 9a46 0013 98e5 0013 9a46 0013 98e5
2730720  0013 9a46 0013 98b1 0013 9a5e 0013 989d 0013 9a66 0013 9889 0013 9a6e 0013 9889 0013 9a6e 0013 9889 0013 9a6e 0013 9855
```

```
2731000  0013 9a86 0013 9841 0013 9a8e 0013 982d 0013 9a96 0013 982d 0013 9a96 0013 982d 0013 9a96 0013 97f9 0013 9aae 0013 97e5
2731060  0013 9ab6 0013 97d1 0013 9abe 0013 97d1 0013 9abe 0013 97d1 0013 9abe 0013 979d 0013 9ad6 0013 9789 0013 9ade 0013 9775
2731140  0013 9ae6 0013 9775 0013 9ae6 0013 9775 0013 9ae6 0013 9741 0013 9afe 0013 972d 0013 9b06 0013 9719 0013 9b0e 0013 9719
2731220  0013 9b0e 0013 9719 0013 9b0e 0013 96e5 0013 9b26 0013 96d1 0013 9b2e 0013 96bd 0013 9b36 0013 96bd 0013 9b36 0013 96bd
2731300  0013 9b36 0013 9689 0013 9b4e 0013 9675 0013 9b56 0013 9661 0013 9b5e 0013 9661 0013 9b5e 0013 9661 0013 9b5e 0013 962d
2731360  0013 9b76 0013 9619 0013 9b7e 0013 9605 0013 9b86 0013 9605 0013 9b86 0013 9605 0013 9b86 0013 95d1 0013 9b9e 0013 95bd
2731440  0013 9ba6 0013 95a9 0013 9bae 0013 95a9 0013 9bae 0013 95a9 0013 9bae 0013 9575 0013 9bc6 0013 9561 0013 9bce 0013 954d
2731520  0013 9bd6 0013 954d 0013 9bd6 0013 954d 0013 9bd6 0013 9519 0013 9bee 0013 9505 0013 9bf6 0013 94f1 0013 9bfe 0013 94f1
2731600  0013 9bfe 0013 94f1 0013 9bfe 0013 94bd 0013 9c16 0013 94a9 0013 9c1e 0013 9495 0013 9c26 0013 9495 0013 9c26 0013 9495
2731660  0013 9c26 0013 9461 0013 9c3e 0013 944d 0013 9c46 0013 9439 0013 9c4e 0013 9439 0013 9c4e 0013 9439 0013 9c4e 0013 9405
2731740  0013 9c66 0013 93f1 0013 9c6e 0013 93dd 0013 9c76 0013 93dd 0013 9c76 0013 93dd 0013 9c76 0013 93a9 0013 9c8e 0013 9395
2732020  0013 9c96 0013 9381 0013 9c9e 0013 9381 0013 9c9e 0013 9381 0013 9c9e 0013 934d 0013 9cb6 0013 9339 0013 9cbe 0013 9325
2732100  0013 9cc6 0013 9325 0013 9cc6 0013 9325 0013 9cc6 0013 92f1 0013 9cde 0013 92dd 0013 9ce6 0013 92c9 0013 9cee 0013 92c9
2732160  0013 9cee 0013 92c9 0013 9cee 0013 9295 0013 9d06 0013 9281 0013 9d0e 0013 926d 0013 9d16 0013 925d 0013 9d16 0013 926d
2732240  0013 9d16 0013 9239 0013 9d2e 0013 9225 0013 9d36 0013 9211 0013 9d3e 0013 9211 0013 9d3e 0013 9211 0013 9d3e 0013 91dd
2732320  0013 9d56 0013 91c9 0013 9d5e 0013 91b5 0013 9d66 0013 91b5 0013 9d66 0013 91b5 0013 9d66 0013 9181 0013 9d7e 0013 916d
2732400  0013 9d86 0013 9159 0013 9d8e 0013 9159 0013 9d8e 0013 9159 0013 9d8e 0013 9125 0013 9da6 0013 9111 0013 9dae 0013 90fd
2732460  0013 9db6 0013 90fd 0013 9db6 0013 90fd 0013 91b6 0013 90c9 0013 9dce 0013 90b5 0013 9dd6 0013 90a1 0013 9dde 0013 90a1
2732540  0013 9dde 0013 90a1 0013 9dde 0013 906d 0013 91f6 0013 9059 0013 9dfe 0013 9045 0013 9e06 0013 9045 0013 9e06 0013 9045
2732620  0013 9e06 0013 9011 0013 9e1e 0013 8ffd 0013 9e26 0013 8fe9 0013 9e2e 0013 8fe9 0013 9e2e 0013 8fe9 0013 9e2e 0013 8fb5
2732700  0013 9e46 0013 8fa1 0013 9e4e 0013 8f8d 0013 9e56 0013 8f8d 0013 9e56 0013 8f8d 0013 9e56 0013 8f59 0013 9e6e 0013 8f45
2732760  0013 9e76 0013 8f31 0013 9e7e 0013 8f31 0013 9e7e 0013 8f31 0013 9e7e 0013 8efd 0013 9e96 0013 8ee9 0013 9e9e 0013 8ed5
2733040  0013 9ea6 0013 8ed5 0013 9ea6 0013 8ed5 0013 9ea6 0013 8ea1 0013 9ebe 0013 8e8d 0013 9ec6 0013 8e79 0013 9ece 0013 8e79
2733120  0013 9ece 0013 8e79 0013 9ece 0013 8e45 0013 9ee6 0013 8e31 0013 9eee 0013 8e1d 0013 9ef6 0013 8e1d 0013 9ef6 0013 8e1d
2733200  0013 9ef6 0013 8de9 0013 9f0e 0013 8dd5 0013 9f16 0013 8dc1 0013 9f1e 0013 8dc1 0013 9f1e 0013 8dc1 0013 9f1e 0013 8d8d
2733260  0013 9f36 0013 8d79 0013 9f3e 0013 8d65 0013 9f46 0013 8d65 0013 9f46 0013 8d65 0013 9f46 0013 8d31 0013 9f5e 0013 8d1d
2733340  0013 9f66 0013 8d09 0013 9f6e 0013 8d09 0013 9f6e 0013 8d09 0013 9f6e 0013 8cd5 0013 9f86 0013 8cc1 0013 9f8e 0013 8cad
2733420  0013 9f96 0013 8cad 0013 9f96 0013 8cad 0013 9f96 0013 8c79 0013 9fae 0013 8c65 0013 9fb6 0013 8c51 0013 9fbe 0013 8c51
2733500  0013 9fbe 0013 8c51 0013 9fbe 0013 8c1d 0013 9f16 0013 8c09 0013 9fde 0013 8bf5 0013 9fe6 0013 8bf5 0013 9fe6 0013 8bf5
2733560  0013 9fe6 0013 8bc1 0013 9ffe 0013 8bad 0013 a006 0013 8b99 0013 a00e 0013 8b99 0013 a00e 0013 8b99 0013 a00e 0013 8b65
2733640  0013 a026 0013 8b51 0013 a02e 0013 8b3d 0013 a036 0013 8b3d 0013 a036 0013 8b3d 0013 a036 0013 8b09 0013 a04e 0013 8af5
2733720  0013 a056 0013 8ae1 0013 a05e 0013 8ae1 0013 a05e 0013 8ae1 0013 a05e 0013 8aad 0013 a076 0013 8a99 0013 a07e 0013 8a85
2734000  0013 a086 0013 8a85 0013 a086 0013 8a85 0013 a086 0013 8a51 0013 a09e 0013 8a3d 0013 a0a6 0013 8a29 0013 a0ae 0013 8a29
2734060  0013 a0ae 0013 8a29 0013 a0ae 0013 89f5 0013 a0c6 0013 89e1 0013 a0ce 0013 89cd 0013 a0d6 0013 89cd 0013 a0d6 0013 89cd
2734140  0013 a0d6 0013 8999 0013 a0ee 0013 8985 0013 a0f6 0013 8971 0013 a0fe 0013 8971 0013 a0fe 0013 8971 0013 a0fe 0013 893d
2734220  0013 a116 0013 8929 0013 a11e 0013 8915 0013 a126 0013 8915 0013 a126 0013 8915 0013 a126 0013 88e1 0013 a13e 0013 88cd
2734300  0013 a146 0013 88b9 0013 a14e 0013 88b9 0013 a14e 0013 88b9 0013 a14e 0013 8885 0013 a166 0013 8871 0013 a16e 0013 885d
2734360  0013 a176 0013 885d 0013 a176 0013 885d 0013 a176 0013 8835 0013 a18e 0013 8821 0013 a196 0013 880d 0013 a19e 0012 eb59
2734440  0013 a1a6 0013 a1bd 0013 a1a6 0400 08af 0000 065f 0013 87e5 0012 eb69 0013 77e1 0013 a1bd 0013 a1a6 0013 87ad 0013 a1d2
2734520  0012 ea69 0013 a1da 0013 a1f1 0013 a1da 0400 08af 0000 0657 0013 87a5 0012 ea79 0013 7809 0013 a1f1 0013 a1da 0013 876d
2734600  0013 a206 0013 874d 0013 a20e 0012 e979 0013 a216 0013 a22d 0013 a216 0400 08af 0000 0657 0013 8745 0012 e989 0013 7849
2734660  0013 a22d 0013 a216 0013 a22d 0013 a216 0013 a22d 0013 a216 0013 86ed 0013 a252 0013 86ed 0013 a252 0013 86ed 0013 a252
2734740  0013 86cd 0013 a26a 0013 86cd 0013 a26a 0013 86cd 0013 a26a 0013 868d 0013 a282 0013 a299 0013 a282 0200 08af 0000 06b7
2735020  0013 86a5 0100 08af 0000 1613 0013 a2a5 0013 a2be 0100 08af 0000 0b13 0013 a2b5 0013 a2ce 0100 08af 0000 0363 0013 a2c5
2735100  0013 a2e6 0300 08af 0000 0763 0012 e989 0013 7849 0013 a2d5 0013 a2f6 0100 08af 0000 0333 0013 a2ed 0013 a306 0011 487c
2735160  0300 6c0f 0000 3287 0000 000c 0013 5978 0013 5978 0001 0070 0000 0000 0013 a2fc 0200 6c0f 0000 3287 0000 0008 0013 5a4c
2735240  0013 a394 0001 0070 0000 0000 0015 6f70 6572 6174 6f72 735f 616e 645f 6f70 636f 6465 7300 0012 0d74 0200 6c17 0000 3287
2735320  0000 0008 0015 b3a8 0015 b3a8 0001 0074 0000 0000 0011 3d00 0200 6abf 0000 3287 0000 0008 0013 a3c4 0013 a3c4 0001 0070
2735400  0000 0000 2954 0018 0002 438a 362c 4538 6bc8 5370 239c 0000 0013 a32c 27f0 0018 0013 a3e8 56f8 4af8 0000 0a87 5370 50f0
2735460  0000 419b 2cac 08af 0002 438a 2ca0 88d9 0000 0000 0000 0000 0013 a3ac 0013 5bac 000d 4a80 0011 2744 28c4 0018 0013 a400
2735540  56f8 4af8 0000 0ab7 5370 50f0 0000 0503 28c4 0018 0013 a418 56f8 4af8 0000 0ad7 5370 50f0 0000 0603 28c4 0018 0013 a430
2735620  56f8 4af8 0000 0b3f 5370 50f0 0000 419b 28c4 0018 0013 a448 56f8 4af8 0000 0de7 5370 50f0 0000 0513 28c4 0020 0013 a468
2735700  56f8 4af8 0000 0a87 55f0 4af8 0000 0ab7 5370 50f0 0000 469b 28c4 0020 0013 a488 56f8 4af8 0000 0a87 55f0 4af8 0000 0ad7
2735760  5370 50f0 0000 479b 28c4 0020 0013 a4a8 56f8 4af8 0000 0a87 55f0 4af8 0000 0b3f 5370 50f0 0000 419b 28c4 0020 0013 a4c8
2736040  56f8 4af8 0000 0a87 55f0 4af8 0000 0de7 5370 50f0 0000 46ab 28c4 0020 0013 a4e8 56f8 4af8 0000 0ab7 55f0 4af8 0000 0ad7
```

```
2736120 5370 50f0 0000 0603 28c4 0020 0013 a508 56f8 4af8 0000 0ab7 55f0 4af8 0000 0b3f 5370 50f0 0000 469b 28c4 0020 0013 a528
2736200 56f8 4af8 0000 0ab7 55f0 4af8 0000 0de7 5370 50f0 0000 0a13 28c4 0020 0013 a548 56f8 4af8 0000 0ad7 55f0 4af8 0000 0b3f
2736260 5370 50f0 0000 479b 28c4 0020 0013 a568 56f8 4af8 0000 0ad7 55f0 4af8 0000 0de7 5370 50f0 0000 0b13 28c4 0020 0013 a588
2736340 56f8 4af8 0000 0b3f 55f0 4af8 0000 0de7 5370 50f0 0000 46ab 28c4 0028 0013 a5b0 56f8 4af8 0000 0a87 55f0 4af8 0000 0ab7
2736420 55f0 4af8 0000 0ad7 5370 50f0 0000 479b 28c4 0028 0013 a5d8 56f8 4af8 0000 0a87 55f0 4af8 0000 0ab7 55f0 4af8 0000 0b3f
2736500 5370 50f0 0000 469b 28c4 0028 0013 a600 56f8 4af8 0000 0a87 55f0 4af8 0000 0ab7 55f0 4af8 0000 0de7 5370 50f0 0000 4bab
2736560 28c4 0028 0013 a628 56f8 4af8 0000 0a87 55f0 4af8 0000 0ad7 55f0 4af8 0000 0b3f 5370 50f0 0000 479b 28c4 0028 0013 a650
2736640 56f8 4af8 0000 0a87 55f0 4af8 0000 0ad7 55f0 4af8 0000 0de7 5370 50f0 0000 4cab 28c4 0028 0013 a678 56f8 4af8 0000 0a87
2736720 55f0 4af8 0000 0b3f 55f0 4af8 0000 0de7 5370 50f0 0000 46ab 28c4 0028 0013 a6a0 56f8 4af8 0000 0ab7 55f0 4af8 0000 0ad7
2737000 55f0 4af8 0000 0b3f 5370 50f0 0000 479b 28c4 0028 0013 a6c8 56f8 4af8 0000 0ab7 55f0 4af8 0000 0ad7 55f0 4af8 0000 0de7
2737060 5370 50f0 0000 0b13 28c4 0028 0013 a6f0 56f8 4af8 0000 0ab7 55f0 4af8 0000 0b3f 55f0 4af8 0000 0de7 5370 50f0 0000 4bab
2737140 28c4 0028 0013 5abc 56f8 4af8 0000 0ad7 55f0 4af8 0000 0b3f 55f0 4af8 0000 0de7 5370 50f0 0000 4cab 0000 002c 0013 c8d8
2737220 b27c b66c 0000 0d86 7fff ffff 0013 841c 0200 0db5 0200 2f35 0000 6c4f 0000 0393 0000 315f 0000 002c 0013 c904 b27c b66c
2737300 0000 0d97 7fff ffff 0013 8448 0200 0db5 0200 224d 0000 6c4f 0000 3287 0000 315f 000f 6d75 7865 735f 666f 725f 706f 7274
2737360 7300 0000 0013 a8a0 0000 0090 b27c b66c 0000 0d88 0000 0d98 000a 4164 0200 0db5 0200 270d 0000 6c4f 0000 3287 0000 315f
2737440 0013 a7ec 0000 0038 b27c b66c 0000 0d89 0000 0d9a 0013 a8a4 0200 0db5 0500 1cdd 0000 6c8f 0000 001b 0000 3287 009f 42a3
2737520 0000 0393 0000 315f 0013 a8a0 0000 002c b4f0 b4e4 0000 0d88 7fff ffff 0008 b0dd 0000 0000 0000 0000 0013 ad64 0002 438a
2737600 0011 2860 2c78 0088 0002 438a 45e8 0020 4714 4768 2e7c ae74 0024 2ba0 0028 0020 3af4 0020 000d 7d48 0028 aa88 0024 2e98
2737660 37c4 0020 3174 4a7c 000c 2c88 0010 2c58 3280 56f8 6e1c 0020 5370 bfcc 2e7c ae74 001c 2ba0 0020 001e 3c48 0000 000d 7d48
2737740 0020 aa88 001c 2e98 37b0 318c 4a7c 0010 2c88 000e 2c58 329c 56f8 6dd8 5370 bfcc 386c 3d30 3cf4 234c 0014 08b4 0013 a90c
2740020 0000 0038 b27c b66c 0000 0d8a 0000 0d9b 0013 a910 0200 0db5 0500 1cdd 0000 6c97 0000 001b 0000 3287 00a0 45a3 0000 0393
2740100 0000 315f 2c78 0034 0002 438a 2520 4740 34e0 0018 3468 33f4 24d0 0000 0013 82ac 001c aa6c aa50 9d88 ac08 aa34 aa34 9d88
2740160 a858 9e0c af34 723c 0013 a9b4 0000 0070 b27c b66c 0000 0d8b 0000 0d9c 0013 a948 0200 0db5 0500 1cdd 0000 6c9f 0000 001b
2740240 0000 3287 00a0 46a3 0000 0393 0000 315f 0013 a9b4 0000 0038 b27c b66c 0000 0d8c 0000 0d9d 0013 a9b8 0200 0db5 0500 1cdd
2740320 0000 6ca7 0000 001b 0000 3287 00a0 4983 0000 0393 0000 315f 2c78 0038 0002 438a 45dc 4728 001c 4740 33d8 382c 001c 3aa0
2740400 0013 e854 0020 33bc 382c 001c 3c48 0000 0014 0953 0018 aa50 aa34 9de0 af34 723c 0013 aae4 0000 00a8 b27c b66c 0000 0d8d
2740460 0000 0d9e 0013 a9f0 0200 0db5 0500 1cdd 0000 6cb7 0000 001b 0000 3287 00a0 4c23 0000 0393 0000 315f 0013 aa24 0000 0038
2740540 b27c b66c 0000 0d8e 0000 0d9f 0013 aa28 0200 0db5 0500 1cdd 0000 6caf 0000 001b 0000 3287 00a0 4a93 0000 0393 0000 315f
2740620 0013 aae4 0000 0038 b27c b66c 0000 0d8f 0000 0da0 0013 aae8 0200 0db5 0500 1cdd 0000 6cbf 0000 001b 0000 3287 00a0 5063
2740700 0000 0393 0000 315f 2c78 0088 0002 438a 45e8 0020 4714 4768 2e7c ae74 0024 2ba0 0028 0020 3af4 0020 000d 7d48 0028 aa88
2740760 0024 2e98 37c4 0020 3174 4a7c 000c 2c88 0010 2c58 3280 56f8 6e1c 0020 5370 bfcc 2e7c ae74 001c 2ba0 0020 001e 3c48 0000
2741040 000d 7d48 0020 aa88 001c 2e98 37b0 318c 4a7c 0010 2c88 000e 2c58 329c 56f8 6dd8 5370 bfcc 386c 3d30 3cf4 234c 0014 0a40
2741120 0013 ab70 0000 0038 b27c b66c 0000 0d90 0000 0da1 0013 ab74 0200 0db5 0500 1cdd 0000 6cc7 0000 001b 0000 3287 00a0 5203
2741200 0000 0393 0000 315f 2c78 0054 0002 438a 45dc 4728 001c 4740 3380 0024 3c48 0000 0013 a32c 0028 3380 0020 3c9c 0000 001c
2741260 0013 a32c 0029 aa88 0024 aa88 0020 9d88 ada8 33d8 382c 001c 3c48 0000 0014 0a78 0018 aa50 aa34 9e0c af34 723c 0013 ac38
2741340 0000 0078 b27c b66c 0000 0d91 0000 0da2 0013 ac3c 0200 0db5 0500 1cdd 0000 6ccf 0000 001b 0000 3287 00a0 53c3 0000 0393
2741420 0000 315f 0013 ac38 0000 0040 0000 0000 0000 0000 0000 0000 0012 c900 0000 0000 0012 c8ac 0012 c858 0012 c780 0000 0000
2741500 0011 3a44 0012 c4ec 0012 c5e0 0012 c634 0000 0000 2c78 0050 0002 438a 45e8 001c 4714 4740 344c 41fc 0000 0003 3818 3c9c
2741560 0000 001c 0014 09a4 0020 3468 4268 0000 0000 0003 382c 001c 3c48 0000 0014 09a4 0018 4538 6d94 5370 4550 6d50 6b74 2340
2741640 0014 0a98 0013 acb8 0000 0038 b27c b66c 0000 0d92 0000 0da3 0013 acbc 0200 0db5 0500 1cdd 0000 6ccf 0000 0023 0000 3287
2741720 00a0 4d23 0000 0393 0000 315f 28c4 0048 0014 0b00 56f8 687c 0020 69b0 46ec 4790 001c 47d0 37f0 3c9c 0000 0020 0014 0af0
2742000 0024 2ecc 3364 3c9c 0000 0020 0013 a32c 0020 aa88 001c aa6c 9d88 ac90 38d4 2330 0014 09a4 0013 aefc 0000 00e0 b27c b66c
2742060 0000 0d93 0000 0da4 0013 acf4 0200 0db5 0500 1cdd 0000 6cdf 0000 0013 0000 3287 00a0 5783 0000 0393 0000 315f 0013 ad28
2742140 0000 0038 b27c b66c 0000 0d94 0000 0da5 0013 a12c 0200 0db5 0500 1cdd 0000 6ce7 0000 0013 0000 3287 00a0 5ae3 0000 0393
2742220 0000 315f 0013 ad60 0000 0038 b27c b66c 0000 0d95 0000 0da6 0013 ad64 0200 0db5 0500 1cdd 0000 6cef 0000 0013 0000 3287
2742300 00a0 5e23 0000 0393 0000 315f 0013 aefc 0000 0038 b130 b66c 0000 0d96 0000 0da7 0013 a7f1 0200 0db5 0500 1cdd 0000 6cf7
2742360 0000 0013 0000 3287 00a0 5f23 0000 0393 0000 315f 2c78 003c 0002 438a 2520 4700 35c8 32d4 24d0 0000 000b 09b0 001c 332c
2742440 4108 0000 0012 04e8 0018 3804 3280 247c 000b 09b0 0014 3d30 3cf4 234c 0012 04e8 2c78 0128 0002 438a 45b8 46ec 24d0 0000
2742520 0014 7fdc 0028 9300 98c4 001e 3348 39a4 0014 808c 0028 3858 3d3c 41d4 0000 0003 242c 0000 0014 7e38 9300 9afc 0020 3348
2742600 3b4c 0000 0014 80ac 0028 3858 3d3c 41d4 0000 0003 242c 0000 0014 7e38 9300 9c10 0020 3348 3b4c 0000 0014 80cc 0028 3858
2742660 3d3c 41d4 0000 0003 242c 0000 0014 7e38 2e7c ae74 0024 2ba0 0028 0082 9300 936c 3ba0 0000 0014 80ec 0028 aa88 0024 2e98
2742740 32b8 247c 0014 801c 0024 3540 0018 001c 3484 3410 0020 3804 4300 0000 0000 0003 0014 89d8 0024 aa88 001c aab4 0000 a1d0
2743020 000c 3df4 0020 4a7c 000c 723c aa88 001c aab4 0001 a1d0 000a 3d18 4a7c 000c 723c 427c 0000 0000 0003 3844 3d3c 4240 0000
2743100 0000 0003 242c 0000 0014 7f28 2c58 38c0 3844 41e8 0000 1da7 4240 0000 0000 6ebf 242c 0000 0014 89f8 0013 afc8 0000 0038
2743160 b27c b66c 0000 0e52 0000 0eb2 0013 afcc 0200 0db5 0500 1cdd 0000 6e67 0000 0013 0000 6e3f 00a2 a2a3 0000 03ab 0000 315f
```

| | | | | | | | | | | | | | | | | | | | | | | | | |
|---|---|---|---|---|---|---|---|---|---|---|---|---|---|---|---|---|---|---|---|---|---|---|---|---|
| 2743240 | 2c78 | 0094 | 0002 | 438a | 45b8 | 46ec | 24d0 | 0000 | 0014 | 7fdc | 001c | 9300 | 98c4 | 001e | 3348 | 39a4 | 0014 | 808c | 001c | 3858 | 3d3c | 41d4 | 0000 | 0003 |
| 2743320 | 242c | 0000 | 0014 | 7e38 | 2e7c | ae30 | 2ba0 | 001c | 0038 | 9300 | 936c | 39f8 | 0014 | 80ec | 001c | aa6c | 2e98 | 32b8 | 24d0 | 0000 | 0014 | 801c | 0018 | 4210 |
| 2743400 | 0000 | 0003 | 3844 | 3d3c | 4240 | 0000 | 0000 | 0003 | 242c | 0000 | 0014 | 7f28 | 2c58 | 38c0 | 3844 | 41e8 | 0000 | 1d8f | 4240 | 0000 | 0000 | 1d9f | 242c | 0000 |
| 2743460 | 0014 | 89f8 | 0013 | b0f8 | 0000 | 0038 | b27c | b66c | 0000 | 0e53 | 0000 | 0eb3 | 0013 | b0fc | 0200 | 0db5 | 0500 | 1cdd | 0000 | 6ecf | 0000 | 0013 | 0000 | 6e3f |
| 2743540 | 00a2 | c1e3 | 0000 | 03ab | 0000 | 315f | 2c78 | 00f8 | 0002 | 438a | 45b8 | 46ec | 24d0 | 0000 | 0014 | 7fdc | 0028 | 9300 | 9afc | 0026 | 3380 | 0020 | 3b4c | 0000 |
| 2743620 | 0014 | 80ac | 0028 | 3858 | 3e70 | 0020 | 4240 | 0000 | 0000 | 0003 | 242c | 0000 | 0014 | 7e38 | 9300 | 9c10 | 0024 | 3380 | 0020 | 39a4 | 0014 | 80cc | 0028 | 3858 |
| 2743700 | 3e70 | 0020 | 4240 | 0000 | 0000 | 0003 | 242c | 0000 | 0014 | 7e38 | 2e7c | ae74 | 0024 | 2ba0 | 0028 | 0068 | 9300 | 936c | 3ba0 | 0000 | 0014 | 80ec | 0028 | aa88 |
| 2743760 | 0024 | 2e98 | 32f0 | 0020 | 24d0 | 0000 | 0014 | 801c | 0024 | 3520 | 0018 | 3468 | 3410 | 001c | 3e70 | 0020 | 4300 | 0000 | 0000 | 0003 | 0014 | 89d8 | 0020 | aa6c |
| 2744040 | aab4 | 0000 | a1d0 | 000c | 3df4 | 001c | 4a7c | 000c | 723c | aa6c | aab4 | 0001 | a1d0 | 000a | 3d0c | 4a7c | 000c | 723c | c5a8 | 2c58 | 38c0 | 3844 | 4254 | 0000 |
| 2744120 | 0000 | 2a57 | 4240 | 0000 | 0000 | 2a5f | 242c | 0000 | 0014 | 89f8 | 0013 | b220 | 0000 | 0038 | b27c | b66c | 0000 | 0e54 | 0000 | 0eb4 | 0013 | b224 | 0200 | 0db5 |
| 2744200 | 0500 | 1cdd | 0000 | 6eff | 0000 | 0013 | 0000 | 6e3f | 00a2 | d4e3 | 0000 | 03ab | 0000 | 315f | 2c78 | 0030 | 0002 | 438a | 2520 | 442c | 0200 | 6eff | 6b48 | 6b88 |
| 2744260 | 4568 | 6c34 | 5370 | 41e8 | 0000 | 6f9f | 4300 | 0000 | 0000 | 328f | 0008 | c11c | 000c | c5a8 | 0028 | 7e4e | 2120 | 5479 | 7065 | 2066 | 6169 | 6c75 | 7265 | 2069 |
| 2744340 | 6e20 | 6172 | 6775 | 6d65 | 6e74 | 2031 | 206f | 6620 | 7e77 | 2f32 | 7e6e | 0069 | 002f | 7e4e | 2120 | 496e | 7374 | 616e | 7469 | 6174 | 696f | 6e20 | 6661 | 756c |
| 2744420 | 7420 | 696e | 2061 | 7267 | 756d | 656e | 7420 | 3220 | 6f66 | 207e | 772f | 327e | 6e00 | 7065 | 0028 | 7e4e | 2120 | 5479 | 7065 | 2066 | 6169 | 6c75 | 7265 | 2069 |
| 2744500 | 6e20 | 6172 | 6775 | 6d65 | 6e74 | 2032 | 206f | 6620 | 7e77 | 2f32 | 7e6e | 0061 | 0031 | 2120 | 4c69 | 7374 | 206f | 6620 | 4953 | 4f20 | 3838 | 3539 | 2063 | 6f64 |
| 2744560 | 6573 | 2065 | 7870 | 6563 | 7465 | 642c | 2062 | 7574 | 2066 | 6f75 | 6e64 | 207e | 717e | 6e00 | 0013 | b368 | 0000 | 0038 | b27c | b66c | 0000 | 0e55 | 0000 | 0eb5 |
| 2744640 | 0013 | b36c | 0200 | 0db5 | 0500 | 1cdd | 0000 | 6f6f | 0000 | 0023 | c000 | 6e3f | 00a4 | 4fc3 | 0000 | 03ab | 0000 | 315f | 2c78 | 0110 | 0002 | 438a | 45dc | 4728 |
| 2744720 | 0020 | 4768 | 47bc | 9328 | 9460 | 0044 | 4568 | 6dd8 | 5370 | 41e8 | 0000 | 703f | 4300 | 0000 | 0000 | 328f | 0008 | c11c | 0024 | 4538 | 6d94 | 5370 | 4568 | 6e1c |
| 2745000 | 0020 | 6b74 | 4254 | 0000 | 0000 | 7047 | 4300 | 0000 | 0000 | 328f | 0008 | c11c | 0020 | 2c88 | 0076 | 2e7c | ae74 | 001c | 2ba0 | 0020 | 0032 | 3228 | 320c | 39f8 |
| 2745060 | 0014 | 7e08 | 0020 | aa88 | 001c | 2e98 | 4568 | 6dd8 | 5370 | 41e8 | 0000 | 704f | 4300 | 0000 | 0000 | 328f | 0008 | c11c | 001c | 2c88 | 003a | 2c58 | 4568 | 6dd8 |
| 2745140 | 5370 | 41e3 | 0000 | 7057 | 4300 | 0000 | 0000 | 328f | 0008 | c11c | 001c | 4568 | 6d50 | 5370 | 4254 | 0000 | 0000 | 705f | 4300 | 0000 | 0000 | 328f | 0008 | c11c |
| 2745220 | 001c | 41fc | 0000 | 0013 | 3818 | 3280 | 6f34 | 386c | 37dc | 41d4 | 0000 | 000b | 6e74 | 3858 | 37dc | 41d4 | 0000 | 0013 | 6e74 | 4568 | 6d0c | 5370 | 4254 | 0000 |
| 2745300 | 0000 | 4d5f | 4300 | 0000 | 0000 | 328f | 0008 | c11c | 000c | c5a8 | 0013 | b480 | 0000 | 0038 | b27c | b66c | 0000 | 0e56 | 0000 | 0eb6 | 0013 | b484 | 0200 | 0db5 |
| 2745360 | 0500 | 1cdd | 0000 | 6f3f | 0000 | 001b | 0000 | 6e3f | 00a3 | f1c3 | 0000 | 03ab | 0000 | 315f | 2c78 | 00e0 | 0002 | 438a | 45e8 | 0020 | 4714 | 4740 | aa6c | aa88 |
| 2745440 | 0020 | 9db0 | ada8 | aa34 | aab4 | 0004 | a424 | 0062 | 4224 | 001c | 0000 | 0003 | 3540 | 0018 | 0028 | 34a0 | 002c | 3410 | 0030 | 3380 | 0024 | 3c9c | 0000 | 0020 |
| 2745520 | 0014 | 8a94 | 0034 | 3774 | 56f8 | 6e1c | 0024 | 55f0 | 6e1c | 0030 | 55f0 | 6e1c | 002c | 55f0 | 6e1c | 0028 | 6af0 | 001c | bfcc | aa88 | 0020 | aaf0 | 0004 | adec |
| 2745600 | 3894 | 001c | 3818 | 379c | 242c | 0000 | 0014 | 7e38 | aa34 | aab4 | 0001 | a424 | 003c | 41fc | 0000 | 0003 | 3380 | 0024 | 3af4 | 0020 | 0014 | 8ab4 | 0028 | 3774 |
| 2745660 | 56f8 | 6e1c | 0024 | 6af0 | 001c | bfcc | aa88 | 0020 | aaf0 | 0001 | adec | 3894 | 001c | 3818 | 379c | 234c | 0014 | 7e38 | aa34 | aab4 | 0000 | a1d0 | 000e | 3774 |
| 2745740 | 4e1c | 0000 | 0000 | 0007 | 723c | c5a8 | 0013 | b4e4 | 0000 | 0038 | b27c | b66c | 0000 | 0e57 | 0000 | 0eb7 | 0013 | b4e8 | 0200 | 0db5 | 0500 | 1cdd | 0000 | 6f47 |
| 2746020 | 0000 | 000b | 0000 | 6e3f | 00a4 | 0763 | 0000 | 03ab | 0000 | 315f | 27f0 | 002c | 0014 | 8b24 | 56f8 | 671c | 55f0 | 6750 | 55f0 | 6784 | 55f0 | 67b8 | 682c | 3050 |
| 2746100 | 24d0 | 0000 | 0014 | 8af0 | 0010 | 2340 | 0014 | 80ec | 0013 | c47c | 0000 | 0ab4 | b27c | b66c | 0000 | 0e58 | 0000 | 0eb8 | 0013 | b604 | 0200 | 0db5 | 0500 | 1cdd |
| 2746160 | 0000 | 22df | 0000 | 0013 | 0000 | 6e3f | 00a4 | 5cc3 | 0000 | 03ab | 0000 | 315f | 0013 | b600 | 0000 | 00e4 | 5d10 | 0000 | 0100 | 3037 | 4b8c | 0000 | 0000 | 707f |
| 2746240 | 5758 | 4af8 | 0000 | 7087 | 55f0 | 4af8 | 0000 | 6fdf | 55f0 | 4af8 | 0000 | 6fcf | 55f0 | 4af8 | 0000 | 6fd7 | 55f0 | 4af8 | 0000 | 6f8f | 55f0 | 4af8 | 0000 | 702f |
| 2746320 | 55f0 | 4af8 | 0000 | 6fef | 55f0 | 4af8 | 0000 | 6fe7 | 55f0 | 4af8 | 0000 | 700f | 55f0 | 4af8 | 0000 | 7007 | 55f0 | 4af8 | 0000 | 7017 | 55f0 | 4af8 | 0000 | 701f |
| 2746400 | 55f0 | 4af8 | 0000 | 6fb7 | 55f0 | 4af8 | 0000 | 6fa7 | 55f0 | 4af8 | 0000 | 7077 | 55f0 | 4af8 | 0000 | 7027 | 55f0 | 4af8 | 0000 | 6fbf | 55f0 | 4af8 | 0000 | 6fc7 |
| 2746460 | 55f0 | 4af8 | 0000 | 6f97 | 55f0 | 4af8 | 0000 | 6f1f | 55f0 | 4af8 | 0000 | 7067 | 55f0 | 4af8 | 0000 | 706f | 55f0 | 4af8 | 0000 | 7037 | 55f0 | 4af8 | 0000 | 6ff7 |
| 2746540 | 55f0 | 4af8 | 0000 | 6fff | 5370 | 228c | 0013 | b638 | 0000 | 0038 | b130 | b66c | 0000 | 0e59 | 0000 | 0eb9 | 0013 | fa09 | 0200 | 0db5 | 0500 | 1cdd | 0000 | 22d7 |
| 2746620 | 0000 | 0013 | 0000 | 6e3f | 00a4 | 5f63 | 0000 | 03ab | 0000 | 315f | 0013 | b668 | 0000 | 0030 | 4e1c | 0000 | 0000 | 6f8f | 537c | 0000 | 0100 | 6f8f | 55f0 | 671c |
| 2746700 | 5370 | 5aec | 0100 | 0ad7 | 4b8c | 0000 | 0000 | 253f | 228c | 09af | 0013 | b6a8 | 0000 | 0040 | 4e1c | 0000 | 0000 | 7087 | 5d7c | 0000 | 0200 | 6f17 | 6160 | 5b58 |
| 2746760 | 0100 | 0ab7 | 4b8c | 0000 | 0000 | 1d8f | 56f8 | 671c | 5370 | 5aec | 0100 | 0ad7 | 4b8c | 0000 | 0000 | 253f | 228c | 08af | 0013 | b6fc | 0000 | 0054 | 4e1c | 0000 |
| 2747040 | 0000 | 6fdf | 5d7c | 0000 | 0300 | 6fdf | 6784 | 6160 | 5de8 | 0000 | 0100 | 0ab7 | 4b8c | 0000 | 0000 | 253f | 5d7c | 0000 | 0100 | 0ab7 | 4b8c | 0000 | 0000 | 1d8f |
| 2747120 | 56f8 | 671c | 5370 | 5aec | 0100 | 0ad7 | 4b8c | 0000 | 0000 | 253f | 228c | b235 | 0013 | b774 | 0000 | 0078 | 4e1c | 0000 | 0000 | 6fcf | 5d7c | 0000 | 0500 | 6fcf |
| 2747200 | 67ec | 0018 | 64a8 | 6160 | 5c9c | 0018 | 0100 | 0ab7 | 4b8c | 0000 | 0000 | 1d8f | 5e54 | 0000 | 0100 | 0ab7 | 4b8c | 0000 | 0000 | 253f | 5de8 | 0000 | 0100 | 0ab7 |
| 2747260 | 4b8c | 0000 | 0000 | 253f | 5d7c | 0000 | 0100 | 0ab7 | 4b8c | 0000 | 0000 | 1d8f | 56f8 | 671c | 5370 | 5aec | 0100 | 0ad7 | 4b8c | 0000 | 0000 | 253f | 228c | b77a |
| 2747340 | 0013 | b7ec | 0000 | 0078 | 4e1c | 0000 | 0000 | 6fd7 | 5d7c | 0000 | 0500 | 6fd7 | 67ec | 0018 | 64a8 | 6160 | 5c9c | 0018 | 0100 | 0ab7 | 4b8c | 0000 | 0000 | 1d8f |
| 2747420 | 5e54 | 0000 | 0100 | 0ab7 | 4b8c | 0000 | 0000 | 253f | 5de8 | 0000 | 0100 | 0ab7 | 4b8c | 0000 | 0000 | 253f | 5d7c | 0000 | 0100 | 0ad7 | 4b8c | 0000 | 0000 | 1d8f |
| 2747500 | 56f8 | 671c | 5370 | 5aec | 0100 | 0ad7 | 4b8c | 0000 | 0000 | 253f | 228c | 0093 | 0013 | b864 | 0000 | 0078 | 4e1c | 0000 | 0000 | 700f | 5d7c | 0000 | 0500 | 700f |
| 2747560 | 67ec | 0018 | 64a8 | 6160 | 5c9c | 0018 | 0100 | 0ab7 | 4b8c | 0000 | 0000 | 1d8f | 5e54 | 0000 | 0100 | 0ab7 | 4b8c | 0000 | 0000 | 253f | 5de8 | 0000 | 0100 | 0ab7 |
| 2747640 | 4b8c | 0000 | 0000 | 253f | 5d7c | 0000 | 0100 | 0ab7 | 4b8c | 0000 | 0000 | 1d8f | 56f8 | 671c | 5370 | 5aec | 0100 | 0ad7 | 4b8c | 0000 | 0000 | 253f | 228c | b882 |
| 2747720 | 0013 | b8dc | 0000 | 0078 | 4e1c | 0000 | 0000 | 7007 | 5d7c | 0000 | 0500 | 7007 | 67ec | 0018 | 64a8 | 6160 | 5c9c | 0018 | 0100 | 0ab7 | 4b8c | 0000 | 0000 | 1d8f |
| 2750000 | 5e54 | 0000 | 0100 | 0ab7 | 4b8c | 0000 | 0000 | 253f | 5de8 | 0000 | 0100 | 0ab7 | 4b8c | 0000 | 0000 | 253f | 5d7c | 0000 | 0100 | 0ad7 | 4b8c | 0000 | 0000 | 1d8f |
| 2750060 | 56f8 | 671c | 5370 | 5aec | 0100 | 0ad7 | 4b8c | 0000 | 0000 | 253f | 228c | a85d | 0013 | b954 | 0000 | 0078 | 4e1c | 0000 | 0000 | 6fff | 5d7c | 0000 | 0500 | 6fff |
| 2750140 | 67ec | 0018 | 64a8 | 6160 | 5c9c | 0018 | 0100 | 0ab7 | 4b8c | 0000 | 0000 | 1d8f | 5e54 | 0000 | 0100 | 0ab7 | 4b8c | 0000 | 0000 | 253f | 5de8 | 0000 | 0100 | 0ab7 |
| 2750220 | 4b8c | 0000 | 0000 | 1d8f | 5d7c | 0000 | 0100 | 0ad7 | 4b8c | 0000 | 0000 | 1d8f | 56f8 | 671c | 5370 | 5aec | 0100 | 0ad7 | 4b8c | 0000 | 0000 | 253f | 228c | 08af |
| 2750300 | 0013 | b994 | 0000 | 0040 | 4e1c | 0000 | 0000 | 6fef | 5d7c | 0000 | 0200 | 6fef | 6160 | 5b58 | 0100 | 0ab7 | 4b8c | 0000 | 0000 | 1d8f | 56f8 | 671c | 5370 | 5aec |

```
2750360 0100 0ad7 4b8c 0000 0000 253f 228c b99a 0013 b9d4 0000 0040 4e1c 0000 0000 6fc7 5d7c 0000 0200 6fc7 6160 5b58 0100 0ab7
2750440 4b8c 0000 0000 229f 56f8 671c 5370 5aec 0100 0ad7 4b8c 0000 0000 253f 228c b8e4 0013 ba14 0000 0040 4e1c 0000 0000 6fe7
2750520 5d7c 0000 0200 6fe7 6160 5b58 0100 0ab7 4b8c 0000 c000 253f 56f8 671c 5370 5aec 0100 0ad7 4b8c 0000 0000 1d8f 228c 1173
2750600 0013 ba78 0000 0064 4e1c 0000 0000 7017 5d7c 0000 0400 7017 64a8 6160 5e54 0000 0100 0ab7 4b8c 0000 0000 1d8f 5de8 0000
2750660 0100 0ab7 4b8c 0000 0000 1d8f 5d7c 0000 0100 0ab7 4b8c 0000 0000 253f 56f8 671c 5370 5aec 0100 0ad7 4b8c 0000 0000 253f
2750740 228c 08af 0013 bb44 0000 00cc 4e1c 0000 0000 702f 5d7c 0000 0900 702f 67ec 0028 66c0 0024 0020 66c0 001c 0018 64a8 6160
2751020 5878 0028 67ec 0028 5370 5ec0 0000 0028 0100 0ad7 4b8c 0000 0000 1d8f 5c9c 0024 0100 0ab7 4b8c 0000 0000 1d8f 5c9c 0020
2751100 0100 0ab7 4b8c 0000 0000 253f 5c9c 001c 0100 0ab7 4b8c 0000 0000 253f 5c9c 0018 0100 0ab7 4b8c 0000 0000 253f 5e54 0000
2751160 0100 0ab7 4b8c 0000 0000 1d8f 5de8 0000 0100 0ab7 4b8c 0000 0000 253f 5d7c 0000 0100 0ab7 4b8c 0000 0000 253f 5d10 0000
2751240 0100 0ab7 4b8c 0000 0000 253f 228c bb4e 0013 bbbc 0000 0078 4e1c 0000 0000 701f 5d7c 0000 0500 701f 67ec 0018 64a8 6160
2751320 5c9c 0018 0100 0ab7 4b8c 0000 0000 1d8f 5e54 0000 0100 0ab7 4b8c 0000 0000 253f 5de8 0000 0100 0ad7 4b8c 0000 0000 253f
2751400 5758 6750 5370 5b58 0100 0ad7 4b8c 0000 0000 253f 5d10 0000 0100 0ad7 4b8c 0000 0000 253f 228c bba9 0013 bbfc 0000 0040
2751460 4e1c 0000 0000 6fb7 5d7c 0000 0200 6fb7 6160 5b58 0100 0ab7 4b8c 0000 0000 1d8f 56f8 671c 5370 5aec 0100 0ad7 4b8c 0000
2751540 0000 253f 228c 1043 0013 bc60 0000 0064 4e1c 0000 0000 6ff7 5d7c 0000 0400 6ff7 64a8 6160 5e54 0000 0100 0ab7 4b8c 0000
2751620 0000 1d8f 5de8 0000 0100 0ab7 4b8c 0000 0000 253f 5d7c 0000 0100 0ab7 4b8c 0000 0000 253f 56f8 671c 5370 5aec 0100 0ad7
2751700 4b8c 0000 0000 253f 228c 05f3 0013 bca0 0000 0040 4e1c 0000 0000 6fbf 5d7c 0000 0200 6fbf 6160 5b58 0100 0ab7 4b8c 0000
2751760 0000 253f 56f8 671c 5370 5aec 0100 0ad7 4b8c 0000 0000 253f 228c bc89 0013 bd20 0000 0080 0013 ba1c 0013 bb4c 0013 bd88
2752040 0013 ba80 0013 be48 0000 0000 0000 0000 0000 0000 0000 0000 0000 0000 0013 bec0 0013 bf4c 0013 bd28 0000 0000 0013 b670
2752120 0013 b640 0013 b1e4 0000 0000 0014 8c4c 0013 bdb4 0013 bbc4 0013 bc68 0013 b99c 0013 b704 0013 b77c 0013 b6b0 0013 b9dc
2752200 0013 b95c 0013 bc04 0013 b8e4 0013 bd80 0000 0060 4e1c 0000 0000 7077 5d7c 0000 0400 7077 64a8 6160 5e54 0000 0100 0ab7
2752260 4b8c 0000 0000 253f 5de8 0000 0100 0ab7 4b8c 0000 0000 253f 5d7c 0000 0100 0ab7 4b8c 0000 0000 253f 5d10 0000 0100 0ab7
2752340 4b8c 0000 0000 253f 228c bd71 0013 bdac 0000 002c 4e1c 0000 0000 7027 5d7c 0000 0100 7027 5a18 0000 0100 0ab7 4b8c 0000
2752420 0000 253f 228c 08af 0013 bddc 0000 0030 4e1c 0000 0000 6faf 5d7c 0000 0100 6faf 55f0 671c 5370 5aec 0100 0ad7 4b8c 0000
2752500 0000 253f 228c b1e2 0013 be40 0000 0064 4e1c 0000 0000 6f97 5d7c 0000 0400 6f97 64a8 6160 5e54 0000 0100 0ab7 4b8c 0000
2752560 0000 253f 5de8 0000 0100 0ab7 4b8c 0000 0000 253f 5d7c 0000 0100 0ad7 4b8c 0000 0000 1d8f 56f8 671c 5370 5aec 0100 0ad7
2752640 4b8c 0000 0000 253f 228c 9339 0013 beb8 0000 0078 4e1c 0000 0000 7037 5d7c 0000 0500 7037 67ec 0018 64a8 6160 5c9c 0018
2752720 0100 0ab7 4b8c 0000 0000 253f 5e54 0000 0100 0ab7 4b8c 0000 0000 253f 5de8 0000 0100 0ad7 4b8c 0000 0000 253f 5d7c 0000
2753000 0100 0ad7 4b8c 0000 0000 229f 56f8 671c 5370 5aec 0100 0ad7 4b8c 0000 0000 253f 228c 0a13 0013 bf44 0000 008c 4e1c 0000
2753060 0000 7067 5d7c 0000 0600 7067 66c0 001c 0018 64a8 6160 5ec0 0000 001c 0100 0ab7 4b8c 0000 0000 253f 5c9c 0018 0100 0ad7
2753140 4b8c 0000 0000 253f 5e54 0000 0100 0a17 4b8c 0000 0000 253f 54e8 0000 0100 0ad7 4b8c 0000 0000 253f 5d7c 0000 0100 0ad7
2753220 4b8c 0000 0000 253f 56f8 671c 5370 5aec 0100 0ad7 4b8c 0000 0000 253f 228c 1043 0013 c47c 0000 0054 4e1c 0000 0000 706f
2753300 5d7c 0000 0300 706f 6784 6160 5de8 0000 0100 0ab7 4b8c 0000 0000 253f 5d7c 0000 0100 0ad7 4b8c 0000 0000 253f 56f8 671c
2753360 5370 5aec 0100 0ad7 4b8c 0000 0000 253f 228c 1173 0041 2f68 6f6d 652f 6f73 6173 322f 622f 7175 696e 7475 732f 6765 6e65
2753440 7269 632f 7170 6c69 6232 2e35 2f6c 6962 7261 7279 2f73 756e 342d 342e 302f 7374 7269 6e67 732e 6f00 003f 2f68 6f6d 652f
2753520 6f73 6173 322f 622f 7175 696e 7475 732f 6765 6e65 7269 632f 7170 6c69 6232 2e35 2f6c 6962 7261 7279 2f73 756e 342d 342f
2753600 7374 7269 6e67 732e 6f00 08af 0000 002c 0014 4c38 b27c b66c 0000 0e79 7fff ffff 0013 c904 0200 0db5 0200 224d 0000 6e5f
2753660 0000 6e3f 0000 315f 000c 4b14 0000 0000 0000 002c 0013 f3e0 b27c b66c 0000 0e7a 7fff ffff 0014 4c6c 0200 0db5 0200 24bd
2753740 0000 3287 0000 6e3f 0000 315f 0015 3101 0015 30e1 0015 3121 000f 4e89 000b dc4d 0015 3081 0015 3211 000f 4d68 000f 4d98
2754020 000f 4d08 000f 4138 000f 4d78 0015 31d1 0015 31f1 0015 3158 0000 0000 0015 3000 0000 0000 0000 0000 0000 0000 0017 7a20
2754100 0017 7a30 0017 7300 0017 7a10 0000 0000 0000 0000 0000 0000 0017 7a60 0000 0000 0000 0000 0000 0000 0017 7a59 000f 4db8
2754160 0000 0000 0015 a611 0014 7f38 0015 a601 000f 4e38 000f 4e08 000f 4e18 000f 4e48 0015 a621 0000 0000 0000 0000 0000 0000
2754240 0000 0000 0000 0000 000f 4dc8 000f 4e70 0000 0000 0000 0000 0000 0000 0000 0000 0000 0000 0000 0000 0000 0000 0000 0000
2754320 0000 0000 0000 0000 0017 7a70 0000 0000 0000 0000 0000 0000 0000 0000 0000 0000 0000 0000 000d 2000 000d 2010 000d 2020
2754400 0000 0000 0000 0000 0000 0000 0000 0000 0000 0000 0000 0000 0000 0000 0000 0000 0000 0000 0000 0000 0000 0000 0000 0000
2754460 0000 0000 0000 0000 0000 0000 0000 0000 0000 0000 000d 2040 0000 0000 0000 0000 0000 0000 0000 0000 0000 0000 0000 0000
2754540 0000 0000 0000 0000 0000 0000 0000 0000 0000 0000 0000 0000 0000 0000 000f 4c10 0000 0000 000e 7230 000e 7200 000e 7229
2754620 0000 0000 000b dc3c 0000 0000 000b dc2c 0000 0000 0000 0000 000b dca4 000b dc94 0015 3061 0015 3198 000b 03c1 000f 4e29
2754700 0014 871d 000e 86bd 000d 2031 0014 8725 0015 3020 0015 3041 0014 837d 0015 30c1 0015 30a1 0015 3231 0015 3251 0000 002c
2754760 000b 33a0 b27c b66c 0000 0e6d 7fff ffff 0013 c2b0 0200 0db5 0200 22ed 0000 6fc7 00a4 a8e3 0000 315f 0000 002c 0013 c284
2755040 b27c b66c 0000 0e6e 7fff ffff 0013 c2dc 0200 0db5 0200 22ed 0000 6f97 00a4 cc03 0000 315f 0000 002c 0013 c2b0 b27c b66c
2755120 0000 0e6f 7fff ffff 0013 c308 0200 0db5 0200 22ed 0000 6faf 00a4 cac3 0000 315f 0000 002c 0013 c2dc b27c b66c 0000 0e70
2755200 7fff ffff 0013 c334 0200 0db5 0200 22ed 0000 7067 00a4 de03 0000 315f 0000 002c 0013 c308 b27c b66c 0000 0e71 7fff ffff
2755260 0013 c360 0200 0db5 0200 22ed 0000 706f 00a4 e143 0000 315f 0000 002c 0013 c334 b27c b66c 0000 0e72 7fff ffff 0013 c38c
2755340 0200 0db5 0200 22ed 0000 7037 00a4 cf23 0000 315f 0000 002c 0013 c360 b27c b66c 0000 0e73 7fff ffff 0013 c3b8 0200 0db5
2755420 0200 22ed 0000 6ff7 00a4 9fe3 0000 315f 0000 002c 0013 c38c b27c b66c 0000 0e74 7fff ffff 0015 8700 0200 0db5 0200 22ed
```

```
2755500 0000 6fff 00a4 f963 0000 315f 2c78 0032 0002 438a 7ae4 0000 8154 0028 8154 0024 8154 0020 7ff4 001c 8154 0018 8148 813c
2755560 7fd0 7c28 0014 9198 0020 87f8 228c 228f 2c78 002e 0002 438a 7ae4 0010 7ed4 7ed4 7ed4 7ed4 8124 7c28 0014 9bc0 0014 8924
2755640 001c 88c9 88e4 8300 891c 0018 228c cc79 0000 0038 000b 3708 b27c b66c 0000 0e75 7fff ffff 0014 4d39 0200 0db5 0300 22e5
2755720 0000 0001 0000 7097 0000 0007 0000 0007 0000 6e3f 0000 315f 0013 c940 0000 02d4 b288 b66c 0000 0e76 7fff ffff 0015 3528
2756000 0200 0db5 0100 15ad 0100 33fd 0000 000b 0000 315f 0013 c4d4 0000 002c b288 b66c 0000 0e76 7fff ffff 0013 c480 0200 0db5
2756060 0100 15ad 0100 33fd 0000 000b 0000 315f 0013 c500 0000 002c b288 b66c 0000 0e76 7fff ffff 0013 c4ac 0200 0db5 0100 15ad
2756140 0100 33fd 0000 000b 0000 315f 0013 c724 0000 0224 0013 c539 0200 0df7 0013 c515 0013 c529 0100 3387 0013 c51d 0200 0b3f
2756220 0000 000f 0000 0013 0300 2a87 0000 228f 0013 c4e8 0000 320f 0200 0abf 0013 c54d 0013 c545 0100 08af 0000 01b7 0200 0abf
2756300 0013 cc15 0013 c565 0200 0abf 0013 cc21 0013 c581 0200 0df7 0000 3387 0013 c571 0300 2a87 0000 03ef 0014 8fc1 0000 23ff
2756360 0200 0abf 0013 c5e9 0013 c58d 0200 0abf 0013 c599 0013 c5c9 0200 0df7 0013 c5a5 0013 c5b9 0100 3387 0013 c5ad 0200 0b3f
2756440 0000 000f 0000 0013 0300 2a87 0000 228f 0013 c578 0000 320f 0200 0abf 0013 c5dd 0013 c5d5 0100 08af 0000 01b7 0200 0abf
2756520 0013 cbe9 0013 c5f5 0200 0abf 0013 cbf5 0013 c611 0200 0df7 0000 3387 0013 c601 0300 2a87 0000 03ef 0014 8f95 0000 23ff
2756600 0200 0abf 0013 c679 0013 c61d 0200 0abf 0013 c629 0013 c659 0200 0df7 0013 c635 0013 c649 0100 3387 0013 c63d 0200 0b3f
2756660 0000 000f 0000 0013 0300 2a87 0000 228f 0013 c608 0000 320f 0200 0abf 0013 c66d 0013 c665 0100 08af 0000 01b7 0200 0abf
2756740 0013 cbbd 0013 c685 0200 0abf 0013 cbc9 0013 c6a1 0200 0df7 0000 3387 0013 c691 0300 2a87 0000 03ef 0014 8f69 0000 23ff
2757020 0200 0abf 0013 c709 0013 c6ad 0200 0abf 0013 c6b9 0013 c6e9 0200 0df7 0013 c6c5 0013 c6d9 0100 3387 0013 c6cd 0200 0b3f
2757100 0000 000f 0000 0013 0300 2a87 0000 228f 0013 c698 0000 320f 0200 0abf 0013 c6fd 0013 c6f5 0100 08af 0000 01b7 0200 0abf
2757160 0013 cb91 0013 c715 0200 0abf 0013 cb9d 0013 c731 0200 0df7 0000 3387 0013 c721 0013 c940 0000 002c b288 b66c 0000 0da8
2757240 7fff ffff 0014 0c20 0200 0db5 0100 15ad 0100 33fd 0000 000b 0000 315f 003c 2f68 6f6d 652f 6f73 6173 312f 612f 7669 6a61
2757320 792f 5648 444c 2f70 6172 7365 722f 7072 6f6c 6f67 2f6e 6577 6e65 772f 7633 2e31 2f65 7374 696d 6174 6f72 0075 003f 2f68
2757400 6f6d 652f 6f73 6173 312f 612f 7669 6a61 792f 5648 444c 2f70 6172 7365 722f 7072 6f6c 6f67 2f6e 6577 6e65 772f 7633 2e31
2757460 2f65 7374 696d 6174 6f72 2e70 6c00 6e67 003c 2f68 6f6d 652f 6f73 6173 312f 612f 7669 6a61 792f 5648 444c 2f70 6172 7365
2757540 722f 7072 6f6c 6f67 2f6e 6577 6e65 772f 7633 2e31 2f63 6869 7073 697a 6572 000a 003f 2f68 6f6d 652f 6f73 6173 312f 612f
2757620 7669 6a61 792f 5648 444c 2f70 6172 7365 722f 7072 6f6c 6f67 2f6e 6577 6e65 772f 7633 2e31 2f63 6869 7073 697a 6572 2e70
2757700 6c00 2525 0039 2f68 6f6d 652f 6f73 6173 312f 612f 7669 6a61 792f 5648 444c 2f70 6172 7365 722f 7072 6f6c 6f67 2f6e 6577
2757760 6e65 772f 7633 2e31 2f66 756e 6974 7300 003c 2f68 6f6d 652f 6f73 6173 312f 612f 7669 6a61 792f 5648 444c 2f70 6172 7365
2760040 722f 7072 6f6c 6f67 2f6e 6577 6e65 772f 7633 2e31 2f66 756e 6974 732e 706c 0074 0000 002c 0013 e88c b27c b66c 0000 0dab
2760120 7fff ffff 0013 a720 0200 0db5 0200 2f35 0000 6127 0000 039b 0000 315f 0000 002c 0013 c024 b27c b66c 0000 0dc7 7fff ffff
2760200 0013 a74c 0200 0db5 0200 2244 0000 6d27 0000 3287 0000 315f 000f 636f 6d70 6172 655f 7374 7269 6e67 7300 0000 0013 cb4c
2760260 0000 0090 b27c b66c 0000 0dad 0000 0dc6 000a d16d 0200 0db5 0200 270d 0000 6d27 0000 3287 0000 315f 0013 c9a4 0000 0038
2760340 b27c b66c 0000 0dae 0000 0dc8 0013 cb50 0200 0db5 0500 1cdd 0000 6d4f 0000 0033 0000 3287 00a0 62c3 0000 039b 0000 315f
2760420 0013 cb4c 0000 002c b4f0 b4e4 0000 0dad 7fff ffff 0008 b0dd 0000 0000 0000 0000 0013 45e0 0002 438a 000b 58d0 2c78 017a
2760500 0002 438a 45e8 001c 4728 0048 4799 0034 47f8 0044 4880 0018 0038 4810 001c 3380 0060 3c9c 0000 001c 000b 562c 0068 3380
2760560 0064 3c9c 0000 001c 000b 58ac 0068 3410 005c 3e70 0064 411c 0000 0060 000c 4118 0060 3380 002c 3c9c 0000 001c 000b 6224
2760640 0060 3380 0030 3c9c 0000 001c 000b 6050 0060 3410 0058 382c 0030 411c 0000 005c 000c 4118 005c 3380 0054 411c 0000 0058
2760720 0011 4914 0058 3410 0050 382c 0034 411c 0000 0054 000d d544 0054 3410 004c 382c 0048 411c 0000 0050 000c 4118 0050 382c
2761000 0044 411c 0000 004c 0011 4914 004c 3380 003c 3c9c 0000 0048 0008 c83c 0048 3380 0040 3c9c 0000 0044 0008 c83c 0044 aa88
2761060 0040 aa88 003c 9db0 af84 0038 3410 0028 382c 0034 40b4 0030 000d d544 0030 3380 0024 411c 0000 002c 0008 c83c 002c 3380
2761140 0020 411c 0000 0028 0008 c83c 0028 aa88 0024 aa98 0020 9db0 ada8 aa34 aab4 0000 a4bc 002a 3364 3c9c 0000 001c 0014 0c78
2761220 001c 3348 4108 0000 0008 c83c 0018 3844 3d3c 3788 242c 0000 000f 5890 3774 4c70 0000 0003 723c 7049 0013 cbc0 0000 0038
2761300 b27c b66c 0000 0daf 0000 0dc9 0013 cbc4 0200 0db5 0500 1cdd 0000 6d4f 0000 001b 0000 3287 00a0 64c3 0000 039b 0000 315f
2761360 2c78 003c 0002 438a 2520 4728 001c 4740 3364 247c 000b 4af4 0020 34e0 001c 3500 0018 3244 3894 001c 4368 40a0 0014 0c58
2761440 0018 aa50 aa34 9d88 af34 723c 0013 cc90 0000 0038 b27c b66c 0000 0db0 0000 0dca 0013 cc94 0200 0db5 0500 1cdd 0000 6d4f
2761520 0000 0013 0000 3287 00a0 65c3 0000 039b 0000 315f 2c78 0098 0002 438a 2520 46d8 3380 0024 24d0 0000 000b 4af4 002c 3380
2761600 0028 42ac 0000 6d5f 0012 11f8 002c 3380 0020 42ac 0000 6d67 0012 11f8 002c 34e0 001c 3500 0018 3484 3eec 0028 382c 0020
2761660 40b4 0024 0014 0c58 0024 2e7c ae74 001c 2ba0 0024 001c 3e70 0020 42ac 0000 6d67 0011 ffe4 0020 aa98 001c 2e98 2c88 0004
2761740 2c58 3d48 4300 0000 0000 6d67 0011 ffa0 0018 aa50 aa34 9d88 af34 723c 0013 ccfc 0000 0038 b27c b66c 0000 0db1 0000 0dcb
2762020 0013 cd00 0200 0db5 0500 1cdd 0000 6d6f 0000 0013 0000 3287 00a0 67a3 0000 039b 0000 315f 2c78 0034 0002 438a 2520 46ec
2762100 3348 247c 000b 52cc 0018 3310 40f4 0000 0008 c93c 0014 3858 4254 0000 0000 0083 3cf4 234c 0014 0d14 0013 cd7c 0000 0038
2762160 b27c b66c 0000 0db2 0000 0dcc 0013 cd80 0200 0db5 0500 1cdd 0000 6d77 0000 001b 0000 3287 00a0 68a3 0000 039b 0000 315f
2762240 2954 0046 0002 438a 57b8 638c 5de8 0000 0200 6d7f 6b88 6784 5818 67b8 5370 5c30 0200 6d7f 6b88 6750 bfcc a858 aab4 0003
2762320 a484 a858 aab4 0002 9eb8 aee8 a858 a890 9db0 aed4 7220 4c69 0013 cf4c 0000 0118 b27c b66c 0000 0db3 0000 0dcd 0013 cdb8
2762400 0200 0db5 0500 1cdd 0000 6d87 0000 0013 0000 3287 00a0 6e83 0000 039b 0000 315f 0013 cdec 0000 0038 b27c b66c 0000 0db4
2762460 0000 0dce 0013 cdf0 0200 0db5 0500 1cdd 0000 648f 0000 001b 0000 3287 00a0 7143 0000 039b 0000 315f 0013 ce24 0000 0038
2762540 b27c b66c 0000 0db5 0000 0dcf 0013 ce28 0200 0db5 0500 1cdd 0000 6d97 0000 001b 0000 3287 00a0 73e3 0000 039b 0000 315f
```

| | | | | | | | | | | | | | | | | | | | | | | | | |
|---|---|---|---|---|---|---|---|---|---|---|---|---|---|---|---|---|---|---|---|---|---|---|---|---|
| 2762620 | 0013 | ce5c | 0000 | 0038 | b27c | b66c | 0000 | 0db6 | 0000 | 01d0 | 0013 | ce60 | 0200 | 0db5 | 0500 | 1cdd | 0000 | 6d9f | 0000 | 0013 | 0000 | 3287 | 00a0 | 7583 |
| 2762700 | 0000 | 039b | 0000 | 315f | 0013 | cf4c | 0000 | 0038 | b27c | b66c | 0000 | 0db7 | 0000 | 0dd1 | 0013 | cf50 | 0200 | 0db5 | 0500 | 1cdd | 0000 | 6da7 | 0000 | 0003 |
| 2762760 | 0000 | 3287 | 00a0 | 7723 | 0000 | 039b | 0000 | 315f | 2c78 | 00b8 | 0002 | 438a | 2520 | 43e4 | 0200 | 2027 | 4b3c | 0000 | 0000 | 635f | 5fa0 | 43c0 | 0200 | 0daf |
| 2763040 | 4b8c | 0000 | 0000 | 3287 | 6bb4 | 247c | 0008 | db9c | 000c | 43e4 | 0200 | 2027 | 4b8c | 0000 | 0000 | 6d67 | 5fa0 | 43c0 | 0200 | 0daf | 4b8c | 0000 | 0000 | 3287 |
| 2763120 | 6bb4 | 247c | 0008 | db9c | 000c | 43e4 | 0300 | 6d8f | 5f78 | 43c0 | 0200 | 0daf | 4b8c | 0000 | 0000 | 3287 | 6bb4 | 247c | 0008 | db9c | 000c | 43e4 | 0300 | 6d97 |
| 2763200 | 5f78 | 43c0 | 0200 | 0daf | 4b8c | 0000 | 0000 | 3287 | 6bb4 | 247c | 0008 | db9c | 000c | 43e4 | 0200 | 6d9f | 5f8c | 43c0 | 0200 | 0daf | 4b8c | 0000 | 0000 | 3287 |
| 2763260 | 6bb4 | 234c | 0008 | db9c | 0013 | d0cc | 0000 | 0038 | b27c | b66c | 0000 | 0db8 | 0000 | 0dd2 | 0013 | d0d0 | 0200 | 0db5 | 0500 | 1cdd | 0000 | 6daf | 0000 | 001b |
| 2763340 | 0000 | 3287 | 00a0 | 7923 | 0000 | 039b | 0000 | 315f | 0029 | 2020 | 2020 | 2020 | 2020 | 4573 | 7469 | 6d61 | 7465 | 6420 | 7369 | 7a65 | 207e | 3266 | 2058 | 207e |
| 2763420 | 3266 | 207e | 7732 | 2e7e | 6e7e | 6e00 | 000e | 6465 | 706f | 7369 | 7420 | 7465 | 7874 | 2032 | 0000 | 0000 | 2c78 | 0108 | 0002 | 438a | 45d0 | 46d8 | 4754 | 43e4 |
| 2763500 | 0200 | 2027 | 4b8c | 0000 | 0000 | 6d5f | 5fa0 | 43c0 | 0200 | 0daf | 4b8c | 0000 | 0000 | 3287 | 6bb4 | 247c | 0008 | db9c | 0024 | 43e4 | 0200 | 2027 | 4b8c | 0000 |
| 2763560 | 0000 | 6d67 | 5fa0 | 43c0 | 0200 | 0daf | 4b8c | 0000 | 0000 | 3287 | 6bb4 | 247c | 0008 | db9c | 0024 | 3380 | 0020 | 3a4c | 000e | 4a50 | 0024 | 3380 | 001c | 411c |
| 2763640 | 0000 | 0020 | 000b | 4af4 | 0020 | 3364 | 40b4 | 001c | 000b | 5cb4 | 001c | 3d48 | 4300 | 0000 | 0000 | 6d5f | 0011 | ffa0 | 0018 | 4368 | 4300 | 0000 | 0000 | 6d67 |
| 2763720 | 0011 | ffa0 | 0018 | 37dc | 3bf4 | 0000 | 0014 | 0e48 | 0014 | 43e4 | 0200 | 2027 | 4b8c | 0000 | 0000 | 6d5f | 5fa0 | 43c0 | 0200 | 0daf | 4b8c | 0000 | 0000 | 3287 |
| 2764000 | 6bb4 | 247c | 0008 | db9c | 0014 | 43e4 | 0200 | 2027 | 4b8c | 0000 | 0000 | 6d67 | 5fa0 | 43c0 | 0200 | 0daf | 4b8c | 0000 | 0000 | 3287 | 6bb4 | 247c | 0008 | db9c |
| 2764060 | 0014 | 2330 | 000d | 81f8 | 0013 | d16c | 0000 | 0070 | b27c | b66c | 0000 | 0db9 | 0000 | 0dd3 | 0013 | d108 | 0200 | 0db5 | 0500 | 1cdd | 0000 | 6daf | 0000 | 0013 |
| 2764140 | 0000 | 3287 | 00a0 | 7243 | 0000 | 039b | 0000 | 315f | 0013 | d16c | 0000 | 0038 | b27c | b66c | 0000 | 0dba | 0000 | 0dd4 | 0013 | d170 | 0200 | 0db5 | 0500 | 1cdd |
| 2764220 | 0000 | 6db7 | 0000 | 001b | 0000 | 3287 | 00a0 | 7e03 | 0000 | 039b | 0000 | 315f | 2c78 | 0030 | 0002 | 438a | 2520 | 4700 | 4754 | 3804 | 24d0 | 0000 | 0014 | 0fe0 |
| 2764300 | 0018 | 3310 | 3bf4 | 0000 | 0014 | 1000 | 0014 | 37f0 | 3cf4 | 234c | 000d | 81f8 | 0013 | d258 | 0000 | 00a8 | b27c | b66c | 0000 | 0dbb | 0000 | 0dd5 | 0013 | d1a8 |
| 2764360 | 0200 | 0db5 | 0500 | 1cdd | 0000 | 6dbf | 0000 | 0013 | 0000 | 3287 | 00a0 | 8003 | 0000 | 039b | 0000 | 315f | 0013 | d1dc | 0000 | 0038 | b27c | b66c | 0000 | 0dbc |
| 2764440 | 0000 | 0dd6 | 0013 | d1e0 | 0200 | 0db5 | 0500 | 1cdd | 0000 | 6db7 | 0000 | 0013 | 0000 | 3287 | 00a0 | 7f03 | 0000 | 039b | 0000 | 315f | 0013 | d258 | 0000 | 0038 |
| 2764520 | b27c | b66c | 0000 | 0dbd | 0000 | 0dd7 | 0013 | d25c | 0200 | 0db5 | 0500 | 1cdd | 0000 | 6dc7 | 0000 | 001b | 0000 | 3287 | 00a0 | 8983 | 0000 | 039b | 0000 | 315f |
| 2764600 | 2c78 | 0044 | 0002 | 438a | 45b8 | 4728 | 001c | 4768 | 3894 | 001c | 3364 | 39a4 | 0014 | 0f24 | 0020 | 3894 | 001c | 3d48 | 3b4c | 0000 | 0014 | 1150 | 0018 | 386c |
| 2764660 | 332c | 39a4 | 0014 | 0fc0 | 0018 | 386c | 3d30 | 2340 | 0014 | 1170 | 0013 | d2d8 | 0000 | 0038 | b27c | b66c | 0000 | 0dbe | 0000 | 0dd8 | 0013 | d2dc | 0200 | 0db5 |
| 2764740 | 0500 | 1cdd | 0000 | 6dcf | 0000 | 001b | 0000 | 3287 | 00a0 | 8a83 | 0000 | 039b | 0000 | 315f | 2c78 | 0048 | 0002 | 438a | 45d0 | 46ec | 4740 | 2ba0 | 0018 | 0012 |
| 2765020 | 3228 | 320c | 3bf4 | 0000 | 0014 | 0e28 | 0018 | 2eb0 | 2c58 | 43e4 | 0300 | 6d8f | 6d94 | 6d50 | 6d0c | 43c0 | 0200 | 0daf | 4b8c | 0000 | 0000 | 3287 | 6bb4 | 234c |
| 2765100 | 0008 | b2bc | 0013 | d358 | 0000 | 0038 | b27c | b66c | 0000 | 0dbf | 0000 | 0dd9 | 0013 | d35c | 0200 | 0db5 | 0500 | 1cdd | 0000 | 6dd7 | 0000 | 001b | 0000 | 3287 |
| 2765160 | 00a0 | 8b83 | 0000 | 039b | 0000 | 315f | 2c78 | 0048 | 0002 | 438a | 45d0 | 46ec | 4740 | 2ba0 | 0018 | 0012 | 3228 | 320c | 3bf4 | 0000 | 0014 | 0e7c | 0018 | 2eb0 |
| 2765240 | 2c58 | 43e4 | 0300 | 6d97 | 6d94 | 6d50 | 6d0c | 43c0 | 0200 | 0daf | 4b8c | 0000 | 0000 | 3287 | 6bb4 | 234c | 0008 | b2bc | 0013 | d4a4 | 0000 | 0070 | b27c | b66c |
| 2765320 | 0000 | 0dc0 | 0000 | 0dda | 0013 | d394 | 0200 | 0db5 | 0500 | 1cdd | 0000 | 6ddf | 0000 | 0003 | 0000 | 3287 | 00a0 | 8d43 | 0000 | 039b | 0000 | 315f | 0013 | d4a4 |
| 2765400 | 0000 | 0038 | b27c | b66c | 0000 | 0dc1 | 0000 | 0ddb | 0013 | d4a8 | 0200 | 0db5 | 0500 | 1cdd | 0000 | 6ddf | 0000 | 000b | 0000 | 3287 | 00a0 | 9043 | 0000 | 039b |
| 2765460 | 0000 | 315f | 002b | 2020 | 2020 | 2020 | 2020 | 4573 | 7469 | 6d61 | 7465 | 6420 | 6e75 | 6d62 | 6572 | 206f | 6620 | 7265 | 6769 | 7374 | 6572 | 7320 | 7e77 | 2e7e |
| 2765540 | 6e00 | 4964 | 0029 | 2020 | 2020 | 2020 | 2020 | 4573 | 7469 | 6d61 | 7465 | 6420 | 6e75 | 6d62 | 6572 | 206f | 6620 | 6d75 | 7865 | 7320 | 7e77 | 2e7e | 6e7e | 6e00 |
| 2765620 | 2954 | 0080 | 0002 | 438a | 56f8 | 687c | 001c | 69b0 | 33bc | 3348 | 3af4 | 001c | 0014 | 1130 | 0020 | 3364 | 3af4 | 001c | 0014 | 12b0 | 0020 | 4550 | 6e58 | 001c |
| 2765700 | 5370 | 42ac | 0000 | 6df7 | 0008 | c0fc | 001c | 455c | 6dd8 | 5370 | 4300 | 0000 | 0000 | 6dff | 0008 | c0fc | 0018 | 4550 | 6d94 | 5370 | 4300 | 0000 | 0000 | 6e07 |
| 2765760 | 0008 | c0fc | 0014 | 4550 | 6d50 | 5370 | 4300 | 0000 | 0000 | 6e0f | 0008 | c0fc | 0010 | 2340 | 0014 | 1208 | 0013 | d564 | 0000 | 0070 | b27c | b66c | 0000 | 0e37 |
| 2766040 | 0000 | 0e97 | 0013 | d754 | 0200 | 0db5 | 0500 | 1cdd | 0000 | 6f27 | 0000 | 002b | 0000 | 6e3f | 00a2 | e1a3 | 0000 | 03ab | 0000 | 315f | 0013 | d564 | 0000 | 0038 |
| 2766120 | b27c | b66c | 0000 | 0e36 | 0000 | 0e96 | 0013 | d4a8 | 0200 | 0db5 | 0500 | 1cdd | 0000 | 6f27 | 0000 | 0023 | 0000 | 6e3f | 00a2 | dfa3 | 0000 | 03ab | 0000 | 315f |
| 2766200 | 27f0 | 0050 | 0013 | d694 | 45b8 | 4714 | 4754 | 47d0 | 4880 | 0018 | 001c | 933c | 936c | 3050 | 3380 | 0020 | 3b4c | 0000 | 0014 | 5b5c | 0024 | 3f68 | 0020 | 3894 |
| 2766260 | 001c | 3804 | 3ba0 | 0000 | 0014 | 84c4 | 001c | 4290 | 0000 | 0018 | 0000 | 0003 | 23e4 | 0000 | 0014 | 82e4 | 0013 | d5dc | 0000 | 0030 | 0011 | 2d18 | 0011 | 2c1c |
| 2766340 | 0011 | 2b10 | 0011 | 27b0 | 0011 | 25f8 | 0011 | 22ec | 0000 | 0000 | 0010 | e370 | 0000 | 0000 | 0000 | 0000 | 2954 | 0048 | 0002 | 438a | 56f8 | 6868 | 69b0 | 5758 |
| 2766420 | 6a50 | 6a00 | 3804 | 3aa0 | 0014 | 13fc | 001c | 2ecc | 4550 | 6e08 | 5370 | 42ac | 0000 | 6df7 | 0008 | c0fc | 0018 | 3804 | 4300 | 0000 | 0000 | 6e2f | 0008 | c0fc |
| 2766500 | 0014 | 2330 | 0014 | 138c | 0013 | d658 | 0000 | 0038 | b27c | b66c | 0000 | 0e35 | 0000 | 0e95 | 0013 | d4e0 | 0200 | 0db5 | 0500 | 1cdd | 0000 | 6f0f | 0000 | 001b |
| 2766560 | 0000 | 6e3f | 00a2 | d8e3 | 0000 | 03ab | 0000 | 315f | 2c78 | 0044 | 0002 | 438a | 45c4 | 46d8 | 2ba0 | 0014 | 0010 | 320c | 3ba0 | 0000 | 0014 | 0eb0 | 0014 | 2eb0 |
| 2766640 | 2c58 | 43e4 | 0200 | 6d9f | 6d50 | 6d0c | 447c | 0000 | 0200 | 0daf | 4b8c | 0000 | 0000 | 3287 | 6bb4 | 234c | 0008 | b2bc | 0013 | d750 | 0000 | 0040 | 0000 | 0000 |
| 2766720 | 0010 | d734 | 0010 | da48 | 0000 | 0000 | 0011 | 2d18 | 0000 | 0000 | c011 | 2b10 | 0011 | 27b0 | 0011 | 25f8 | 0011 | 22ec | 0000 | 0000 | 0010 | e370 | 0000 | 0000 |
| 2767000 | 0000 | 0000 | 2954 | 00b8 | 0002 | 438a | 45e8 | 001c | 4728 | 0020 | 4754 | 47d0 | 4810 | 0018 | 3804 | 3c9c | 0000 | 0020 | 0014 | 5b5c | 0024 | 2ecc | 3364 | 3c9c |
| 2767060 | 0000 | 001c | 0014 | 5b5c | 0024 | 9314 | 9460 | 002a | aa6c | aa50 | 9db0 | aa34 | 9db0 | af34 | 4224 | 0018 | 0000 | 0003 | 39fc | 0020 | 386c | 37f0 | 37c4 | 001c |
| 2767140 | 242c | 0000 | 0014 | 82c4 | 9300 | 9460 | 002c | aa6c | aa50 | 9db0 | aa18 | 9db0 | af48 | 4290 | 0000 | 0018 | 0000 | 0003 | 38fc | 0020 | 386c | 37f0 | 37c4 | 001c |
| 2767220 | 242c | 0000 | 0014 | 82c4 | 38c0 | 41fc | ffff | fffb | 382c | 0020 | 3af4 | 001c | 0014 | 84e4 | 001c | aa6c | aa50 | 9db0 | aa34 | 9db0 | af34 | 723c | 0013 | d920 |
| 2767300 | 0000 | 0070 | b27c | b66c | 0000 | 0e38 | 0000 | 0e98 | 0013 | d78c | 0200 | 0db5 | 0500 | 1cdd | 0000 | 6f1f | 0000 | 0023 | 0000 | 6e3f | 00a2 | dce3 | 0000 | 03ab |
| 2767360 | 0000 | 315f | 0013 | d920 | 0000 | 0038 | b27c | b66c | 0000 | 0e39 | 0000 | 0e99 | 0013 | d924 | 0200 | 0db5 | 0500 | 1cdd | 0000 | 6f1f | 0000 | 002b | 0000 | 6e3f |
| 2767440 | 00a2 | dea3 | 0000 | 03ab | 0000 | 315f | 2c78 | 0160 | 0002 | 438a | 45d0 | 46ec | 477c | 47a8 | 4880 | 0018 | 001c | 3380 | 0020 | 3a4c | 0014 | 5b5c | 002c | 3410 |
| 2767520 | 0028 | 37dc | 3ba0 | 0000 | 0014 | 7e08 | 002c | 933c | 9460 | 0052 | aa88 | 0028 | aab4 | 0000 | a424 | 0046 | aa88 | 0020 | aa18 | 9db0 | aa6c | 9db0 | af84 | 001c |
| 2767600 | aa88 | 001c | aab4 | 0000 | a3ec | 247c | 0014 | 7f1c | 002c | 38ac | 3844 | 3818 | 3bf4 | 0000 | 0014 | 8540 | 002c | 3858 | 37dc | 41d4 | 0000 | 0003 | 242c | 0000 |
| 2767660 | 0014 | 7e38 | 9350 | 001c | 9460 | 0052 | aa88 | 0028 | aab4 | 0000 | a424 | 0046 | aa88 | 001c | aab4 | 0000 | a3ec | aa88 | 0020 | aa18 | 9db0 | aa88 | 001c | 9db0 |

```
2767740 af70 247c 0014 7fdc 002c 38ac 3844 3818 3bf4 0000 0014 8540 002c 3858 37dc 41d4 0000 0003 242c 0000 0014 7e38 aa88 0028
2770020 aab4 0000 a4bc 003a 37f0 32f0 0024 247c 0008 b39c 0028 38e8 4268 0000 ffff fffb 3e70 0024 3bf4 0000 0014 84e4 0024 aa88
2770100 0020 aa18 9db0 aa6c 9db0 af84 001c 723c 3f68 0020 3894 001c 37dc 3aa0 0014 84c4 001c 247c 0014 7fdc 001c 38ac 3844 3818
2770160 3bf4 0000 0014 8540 0014 3858 37dc 41d4 0000 0003 242c 0000 0014 7e38 0013 dc58 0000 00e0 b27c b66c 0000 0e3a 0000 0e9a
2770240 0013 d95c 0200 0db5 0500 1cdd 0000 6eb7 0000 001b 0000 6e3f 00a2 b963 0000 03ab 0000 315f 0013 d990 0000 0038 b27c b66c
2770320 0000 0e3b 0000 0e9b 0013 d994 0200 0db5 0500 1cdd 0000 6eb7 0000 0023 0000 6e3f 00a2 bae3 0000 03ab 0000 315f 0013 d9c8
2770400 0000 0038 b27c b66c 0000 0e3c 0000 0e9c 0013 d9cc 0200 0db5 0500 1cdd 0000 6eb7 0000 002b 0000 6e3f 00a2 bbe3 0000 03ab
2770460 0000 315f 0013 dc58 0000 0038 b27c b66c 0000 0e3d 0000 0e9d 0013 dc5c 0200 0db5 0500 1cdd 0000 6eb7 0000 0033 0000 6e3f
2770540 00a2 bce3 0000 03ab 0000 315f 27f0 00c8 0013 dac4 45dc 4700 4740 47bc 3614 0018 4880 001c 001c 933c 936c 3050 3bf4 0000
2770620 0014 5b5c 0024 3380 0020 39a4 0014 5b5c 0024 9314 9afc 0024 aa88 0020 aa34 9db0 af84 001c aa88 001c aab4 0000 a3ec aa34
2770700 aab4 0000 a3ec 2c88 005c 9350 001c 9afc 0024 aa88 0020 aa88 001c 9db0 af48 aa34 aab4 0000 a3ec aa88 001c aab4 0000 a3ec
2770760 2c88 0032 9314 93a8 002a 9350 001c 93a8 0022 382c 001c 3c9c 0000 0020 0014 85e4 0024 aa88 0020 aa88 001c 9db0 af48 2c88
2771040 0004 c5a8 4224 0018 0000 0003 23e4 0000 0014 8604 28c4 0094 0013 db58 45b8 4728 001c 477c 47bc 4848 0018 4880 001c 0020
2771120 9350 001c 936c 3050 3380 0024 3b4c 0000 0014 5b5c 002c 933c 93a8 0006 2c88 0024 3380 0028 3c48 0000 0014 5b5c 002c aa88
2771200 0024 aa88 0028 9db0 af5c aa50 aab4 0000 a3ec 3f68 0024 3894 0020 3834 3ba0 0000 0014 84c4 0020 4290 0000 0018 0000 0003
2771260 38fc 001c 386c 37f0 3b4c 0000 0014 82e4 001c 2304 0014 8630 2954 00fc 0002 438a 45b8 4728 0024 477c 47bc 4848 0018 4880
2771340 001c 001c 3804 3c9c 0000 0024 0014 5b5c 002c 2ecc 3380 0020 3b4c 0000 0014 5b5c 002c 933c 93a8 0006 2c88 001e 3380 0028
2771420 3c48 0000 0014 5b5c 002c aa88 0028 aa50 9d88 aa88 0020 a168 9314 9460 0032 aa88 0020 aa50 9db0 aa34 9db0 af84 001c 4290
2771500 0000 0018 0000 0003 38fc 0024 3d6c 37f0 3b4c 0000 0014 82c4 0028 2c88 0062 9350 001c 9460 0032 aa88 0020 aa50 9db0 aa88
2771560 001c 9db0 af48 4290 0000 0018 0000 0003 38fc 0024 386c 37f0 3b4c 0000 0014 82c4 0028 2c88 002a 38c0 4268 0000 ffff fffb
2771640 382c 0024 3b4c 0000 0014 84e4 0024 aa88 0020 aa50 9db0 aa34 9db0 af84 001c 2304 0014 8630 0013 dd04 0000 0070 b27c b66c
2771720 0000 0e3e 0000 0e9e 0013 dc94 0200 0db5 0500 1cdd 0000 7007 0000 0023 0000 6e3f 00a4 3183 0000 03ab 0000 315f 0013 dd04
2772000 0000 0038 b27c b66c 0000 0e3f 0000 0e9f 0013 dd08 0200 0db5 0500 1cdd 0000 6f2f 0000 0023 0000 6e3f 00a4 2723 0000 03ab
2772060 0000 315f 2c78 003c 0002 438a 45b8 46ec 47e4 3468 37f0 39a4 0014 86fc 001c aa50 aab4 0000 a3ec 2ba0 001c 000a 379c 4a7c
2772140 0018 723c 2c58 38e8 3d6c 2330 0014 84e4 0013 de84 0000 0038 b27c b66c 0000 0e40 0000 0ea0 0013 de88 0200 0db5 0500 1cdd
2772220 0000 6f37 0000 0023 0000 6e3f 00a4 2623 0000 03ab 0000 315f 2c78 0148 0002 438a 45dc 46d8 4754 47f8 001c 933c 9460 007e
2772300 aa6c aab4 0000 a3ec 9300 9460 0022 aa18 aab4 0000 a3ec aa88 001c aa6c 9db0 aa18 9db0 af48 aa34 aab4 0000 a3ec 723c 9314
2772360 9460 0022 aa34 aab4 0000 a3ec aa88 001c aa6c 91b0 aa34 9db0 af34 aa18 aab4 0000 a3ec 723c aa88 001c aa6c 9db0 adec aa50
2772440 aab4 0000 a3ec 37f0 3bf4 0000 0014 05e4 0020 aa50 aa34 9db0 af34 723c 9300 9460 0058 aa18 aab4 0000 a3ec 9314 9460 0022
2772520 aa34 aab4 0000 a3ec aa98 001c aa18 9db0 aa34 91b0 af70 aa6c aab4 0000 a3ec 723c aa88 001c aa18 9db0 adec aa50 aab4 0000
2772600 a3ec 37f0 3bf4 0000 0014 85e4 0020 aa50 aa34 9db0 af70 723c 9314 9460 0028 aa88 001c aa34 9db0 adec aa50 aab4 0000 a3ec
2772660 37dc 3a4c 0014 85e4 0020 aa50 aa18 9db0 af70 723c 3348 3c9c 0000 001c 0014 85e4 0020 aa88 001c aa50 9db0 af70 37f0 3a4c
2772740 0014 85e4 0018 aa50 aa34 9db0 af34 723c 0013 dfb8 0000 00e0 b27c b66c 0000 0e41 0000 0ea1 0013 dec0 0200 0db5 0500 1cdd
2773020 0000 6f2f 0000 0013 0000 6e3f 00a4 2f23 0000 03ab 0000 315f 0013 def4 0000 0038 b27c b66c 0000 0e42 0000 0ea2 0013 def8
2773100 0200 0db5 0500 1cdd 0000 6ed7 0000 001b 0000 6e3f 00a2 c3e3 0000 03ab 0000 315f 0013 df2c 0000 0038 b27c b66c 0000 0e43
2773160 0000 0ea3 0013 df30 0200 0db5 0500 1cdd 0000 6ed7 0000 0023 0000 6e3f 00a2 c5e3 0000 03ab 0000 315f 0013 dfb8 0000 0038
2773240 b27c b66c 0000 0e44 0000 0ea4 0013 dfbc 0200 0db5 0500 1cdd 0000 6ed7 0000 002b 0000 6e3f 00a2 c6e3 0000 03ab 0000 315f
2773320 2c78 0054 0002 438a 45c4 4728 0020 4768 47a8 4864 0018 247c 0014 7fdc 0024 3380 001c 3c9c 0000 0020 0014 87cc 0020 aa88
2773400 001c aaf0 0004 ac4c 3968 0018 38ac 386c 3ba0 0000 0014 87ec 0010 aa18 aab4 0000 a484 22a0 0013 e0b4 0000 00a8 b27c b66c
2773460 0000 0e45 0000 0ea5 0013 dff4 0200 0db5 0500 1cdd 0000 6edf 0000 001b 0000 6e3f 00a2 c7e3 0000 03ab 0000 315f 0013 e028
2773540 0000 0038 b27c b66c 0000 0e46 0000 0ea6 0013 e02c 0200 0db5 0500 1cdd 0000 6edf 0000 0023 0000 6e3f 00a2 c9a3 0000 03ab
2773620 0000 315f 0013 e0b4 0000 0038 b27c b66c 0000 0e47 0000 0ea7 0013 e0b8 0200 0db5 0500 1cdd 0000 6edf 0000 002b 0000 6e3f
2773700 00a2 caa3 0000 03ab 0000 315f 2c78 0054 0002 438a 45c4 4728 0020 4768 47a8 4864 0018 247c 0014 7fdc 0024 3380 001c 3c9c
2773760 0000 0020 0014 87cc 0020 aa88 001c aaf0 0002 ac4c 3968 0018 38ac 386c 3ba0 0000 0014 87ec 0010 aa18 aab4 0000 a484 22a0
2774040 0013 e154 0000 0070 b27c b66c 0000 0e48 0000 0ea8 0013 e0f0 0200 0db5 0500 1cdd 0000 6ee7 0000 0013 0000 6e3f 00a2 cba3
2774120 0000 03ab 0000 315f 0013 e154 0000 0038 b27c b66c 0000 0e49 0000 0ea9 0013 e158 0200 0db5 0500 1cdd 0000 6ee7 0000 001b
2774200 0000 6e3f 00a2 cda3 0000 03ab 0000 315f 2c78 0030 0002 438a 45b8 4754 3540 0018 001c 3484 33d8 39a4 0014 59d4 0020 3fe4
2774260 0018 001c 3da8 316c 2410 0000 0014 5c34 0013 e1e0 0000 0038 b27c b66c 0000 0e4a 0000 0eaa 0013 e1e4 0200 0db5 0500 1cdd
2774340 0000 6ee7 0000 002b 0000 6e3f 00a2 cea3 0000 03ab 0000 315f 2c78 0054 0002 438a 45c4 4728 0020 4768 47a8 4864 0018 247c
2774420 0014 7fdc 0024 3380 001c 3c9c 0000 0020 0014 87cc 0020 aab4 0007 aa88 001c 9db0 ac4c 3968 0018 38ac 386c 39f8 0014 87ec
2774500 0010 aa18 aab4 0000 a484 22a0 0013 e280 0000 0038 b27c b66c 0000 0e4b 0000 0eab 0013 e284 0200 0db5 0500 1cdd 0000 6f4f
2774560 0000 0013 0000 6e3f 00a4 3e63 0000 03ab 0000 315f 2938 0032 0013 e248 5d10 0000 0100 2a37 671c 2520 46d8 3050 9294 9410
2774640 332c 247c 0014 87cc 0014 aab4 0001 aa34 9db0 af34 723c 2525 2954 0034 0002 438a 45b8 4cc4 0000 0003 9300 98c4 000c 320c
2774720 2420 0000 0014 808c 9300 9afc 0008 2340 0014 88f4 2420 0000 0014 80ec 0013 e378 0000 0070 b27c b66c 0000 0e4c 0000 0eac
2775000 0013 e2bc 0200 0db5 0500 1cdd 0000 6ea7 0000 000b 0000 6e3f 00a2 b4e3 0000 03ab 0000 315f 0013 e378 0000 0038 b27c b66c
```

```
2775060 0000 0e4d 0000 0ead 0013 e37c 0200 0db5 0500 1cdd 0000 6ea7 0000 0013 0000 6e3f 00a2 b6a3 0000 03ab 0000 315f 2c78 0088
2775140 0002 438a 45b8 4700 9328 936c 9300 97ac 2ba0 001c 002a 43e4 0200 6f87 6d0c 6aa0 447c 0000 0200 0daf 4b8c 0000 0000 6e3f
2775220 6bb4 247c 0008 db5c 001c 2c88 000c 2c58 32d4 4c70 0000 0003 aa6c aaf0 0001 ada8 44a0 0000 0200 6f87 6d0c 6d80 447c 0000
2775300 0200 0daf 4b8c 0000 0000 6e3f 6bb4 247c 0009 b2fc 0018 386c 37f0 39a4 0014 5554 000c 2eb0 0013 e52c 0000 0170 b27c b66c
2775360 0000 0e4e 0000 0eae 0013 e3b4 0200 0db5 0500 1cdd 0000 6e6f 0000 0013 0000 6e3f 00a2 a463 0000 03ab 0000 315f 0013 e3e8
2775440 0000 0038 b27c b66c 0000 0e4f 0000 0eaf 0013 e530 0200 0db5 0500 1cdd 0000 6e7f 0000 001b 0000 6e3f 00a2 a7e3 0000 03ab
2775520 0000 315f 0013 e428 0000 0040 0000 0000 0000 0000 0000 0000 0000 0000 0000 0000 0014 8a74 0014 8ad0 0014 8a18 0014 8bfc
2775600 0014 8ba8 0014 8a08 0014 8a58 0000 0000 0014 8a28 0013 e52c 0000 00c0 0000 0000 0000 0000 0014 8904 0014 087c 0014 8550
2775660 0014 89b8 0014 83ac 0014 8a18 000e 4411 0014 8815 0014 8864 0014 828c 0014 836c 0014 8a28 0014 8314 0014 8454 0000 0000
2775740 0014 84f4 0014 8484 0014 8424 0014 870c 0014 8a74 0014 8ad0 0014 88a8 0000 0000 0014 826c 0014 8168 0014 8a58 0000 0000
2776020 0000 0000 0000 0000 0000 0000 0000 0000 0000 0000 0000 0000 0000 0000 0000 0000 0000 0000 0000 0000 0000 0000 0000 0000
2776100 0000 0000 0000 0000 0000 0000 0000 0000 0000 0000 2954 0044 0002 438a 36a4 2520 4740 332c 5d7c 0000 0300 6e7f 6b48 6c08
2776160 6d0c 3858 4254 0000 0000 0013 359c 247c 0008 cebc 0014 3d60 4254 0000 0000 001b 2420 0000 0008 cebc 0013 e618 0000 0038
2776240 b27c b66c 0000 0e50 0000 0eb0 0013 e61c 0200 0db5 0500 1cdd 0000 6e7f 0000 0023 0000 6e3f 00a2 a9a3 0000 03ab 0000 315f
2776320 27fc 0050 0013 e5b0 3724 001c 373c 0018 92a8 9860 92e4 001c 9860 92e4 0018 9a90 3050 3754 0028 0018 4224 0024 ffff fffb
2776400 4224 0020 0000 0003 427c 0000 ffff fffb 4268 0000 0000 0003 239c 0000 0014 899c 2954 0064 0002 438a 370c 0018 2520 4768
2776460 47a8 332c 5d7c 0000 0400 6e7f 6b48 6c48 0018 6394 6d0c 3858 4254 0000 0000 0013 35b0 0018 24d0 0000 0008 cebc 0018 3858
2776540 4254 0000 0000 001b 3bf4 0000 0008 cebc 0014 3d60 4254 0000 0000 0023 2420 0000 0008 cdfc 0013 e8f4 0000 0114 b27c b66c
2776620 0000 0e51 0000 0eb1 0013 af00 0200 0db5 0500 1cdd 0000 6ebf 0000 0013 0000 6e3f 00a2 bee3 0000 03ab 0000 315f 0013 e8f4
2776700 0000 00dc 6572 7428 6675 6e63 7469 6f6e 5f64 6973 7461 6e63 6528 4f70 4964 312c 204f 7049 6432 2c20 4469 7374 616e 6365
2776760 2929 292e 0a0a 7061 7261 6c6c 203a 2d0a 0928 0a09 2020 2070 6172 312c 0a09 2020 2066 6169 6c0a 093b 0a09 2020 2074 7275
2777040 650a 0929 2e0a 0a70 6172 3120 3a2d 0a09 6578 6973 7473 5f6f 7065 7261 746f 7228 4f70 3129 2c0a 096f 7065 7261 746f 725f
2777120 6e75 6d62 6572 284f 7031 2c20 4e31 292c 0a09 6578 6973 7473 5f6f 7065 7261 746f 7228 4f70 3229 2c0a 096f 7065 7261 746f
2777200 725f 6e75 6d62 6572 284f 7032 2c20 4e32 292c 0a09 4e31 205c 0014 6675 6e63 7469 6f6e 616c 5f70 726f 7869 6d69 7479 0021
2777260 0012 7265 6769 7374 6572 5f70 726f 7869 6d69 7479 0013 e772 0011 4b8c 0300 6c57 0000 3287 0000 000c 0013 86d8 0013 86d8
2777340 0001 0071 0000 0000 0011 be5c 0300 6c5f 0000 3287 0000 000c 0013 87c8 0013 87c8 0001 0071 0000 0000 0011 4c18 0200 6c67
2777420 0000 3287 0000 0008 0013 8908 0013 8908 0001 0071 0000 0000 0016 7061 7261 6c6c 656c 5f66 726f 6d5f 7363 6865 6475 6c65
2777500 0013 e7d9 0003 6d75 7800 0d68 0011 4d08 0200 6c6f 0000 3287 0000 0008 0013 88a0 0013 88a0 0001 0071 0000 0000 0005 6e61
2777560 6d65 3100 0013 6675 6e63 7469 6f6e 616c 5f64 6973 7461 6e63 6500 17a7 0011 4e14 0300 6c77 0000 3287 0000 000c 0013 875c
2777640 0013 875c 0001 0071 0000 0000 0014 467c 0015 4074 0011 4f20 0300 6c8f 0000 3287 0000 000c 0013 a814 0013 a814 0001 0072
2777720 0000 0000 0011 4e88 0300 6c7f 0000 3287 0000 000c 0013 8834 0013 8834 0001 0071 0000 0000 0000 002c 0013 ea00 b27c b66c
3000000 0000 0de2 7fff ffff 0013 c8d8 0200 0db5 0200 2f35 0000 6d37 0000 03a3 0000 315f 0000 002c 0014 1440 b27c b66c 0000 0f4a
3000060 7fff ffff 0014 4c38 0200 0db5 0200 224d 0000 6d37 0000 3287 0000 315f 0010 4d50 595f 3136 5831 365f 3253 434f 4d50 0000
3000140 0013 ea28 0000 002c b27c b66c 0000 0de4 0000 0f49 000a d16d 0200 0db5 0200 270d 0000 6d37 0000 3287 0000 315f 002b 2f68
3000220 6f6d 652f 6f73 6173 322f 622f 7175 696e 7475 732f 7077 312e 312f 6c69 6272 6172 792f 7374 7269 6e67 7300 5f72 002e 2f68
3000300 6f6d 652f 6f73 6173 322f 622f 7175 696e 7475 732f 7077 312e 312f 6c69 6272 6172 792f 7374 7269 6e67 732e 706c 004c 6973
3000360 0036 2f68 6f6d 652f 6f73 6173 322f 622f 7175 696e 7475 732f 6765 6e65 7269 632f 7170 6c69 6232 2e35 2f6c 6962 7261 7279
3000440 2f73 7472 696e 6773 0074 655f 0039 2f68 6f6d 652f 6f73 6173 322f 622f 7175 696e 7475 732f 6765 6e65 7269 632f 7170 6c69
3000520 6232 2e35 2f6c 6962 7261 7279 2f73 7472 696e 6773 2e70 6c00 0000 002c 0014 3518 b27c b66c 0000 0de7 7fff ffff 0013 e88c
3000600 0200 0db5 0200 2f35 0000 6e5f 0000 03ab 0000 315f 0013 f410 0000 0098 b288 b66c 0000 0de6 7fff ffff 0013 ea00 0200 0db5
3000660 0100 15ad 0100 33fd 0000 000b 0000 315f 0013 ea94 0000 0040 b27c b66c 0000 0de8 0000 0e77 0013 e8b8 0200 0db5 0500 26f5
3000740 0000 1fc7 0000 26ef 0000 03ab 0200 09cd 0000 06a3 0000 002b 0000 3a2f 0000 315f 0013 f410 0000 002c b27c b66c 0000 0de9
3001020 0000 0e78 000a d16d 0200 0db5 0200 270d 0000 6e5f 0000 6e3f 0000 315f 0000 002c 0012 a8d0 b27c b66c 0000 0deb 7fff ffff
3001100 0014 35dc 0200 0db5 0200 284d 0000 6e3f 0000 6e5f 0000 315f 0000 0034 0012 a9cc b27c b66c 0000 0dec 7fff ffff 0013 eb24
3001160 0200 0db5 0400 242d 0000 6e67 0000 0013 0000 6e3f 0000 21cf 0000 315f 0000 0034 0013 eaf0 b27c b66c 0000 0ded 7fff ffff
3001240 0013 eb58 0200 0db5 0400 242d 0000 6e6f 0000 0013 0000 6e3f 0000 21cf 0000 315f 0000 0034 0013 eb24 b27c b66c 0000 0dee
3001320 7fff ffff 0013 eb8c 0200 0db5 0400 242d 0000 6e77 0000 0013 0000 6e3f 0000 21cf 0000 315f 0000 0034 0013 eb58 b27c b66c
3001400 0000 0def 7fff ffff 0013 ebc0 0200 0db5 0400 242d 0000 6e7f 0000 001b 0000 6e3f 0000 21cf 0000 315f 0000 0034 0013 eb8c
3001460 b27c b66c 0000 0df0 7fff ffff 0013 ebf4 0200 0db5 0400 242d 0000 6e7f 0000 0023 0000 6e3f 0000 21cf 0000 315f 0000 0034
3001540 0013 ebc0 b27c b66c 0000 0df1 7fff ffff 0013 ec28 0200 0db5 0400 242d 0000 6e87 0000 001b 0000 6e3f 0000 21cf 0000 315f
3001620 0000 0034 0013 ebf4 b27c b66c 0000 0df2 7fff ffff 0013 ec5c 0200 0db5 0400 242d 0000 6e8f 0000 0013 0000 6e3f 0000 21cf
3001700 0000 315f 0000 0034 0013 ec28 b27c b66c 0000 0df3 7fff ffff 0013 ec90 0200 0db5 0400 242d 0000 6e8f 0000 001b 0000 6e3f
3001760 0000 21cf 0000 315f 0000 0034 0013 ec5c b27c b66c 0000 0df4 7fff ffff 0013 ecc4 0200 0db5 0400 242d 0000 6e97 0000 0013
3002040 0000 6e3f 0000 21cf 0000 315f 0000 0034 0013 ec90 b27c b66c 0000 0df5 7fff ffff 0013 ecf8 0200 0db5 0400 242d 0000 6e97
3002120 0000 001b 0000 6e3f 0000 21cf 0000 315f 0000 0034 0013 ecc4 b27c b66c 0000 0df6 7fff ffff 0013 ed2c 0200 0db5 0400 242d
```

```
3002200  0000 6e9f 0000 0013 0000 6e3f 0000 21cf 0000 315f 0000 0034 0013 ecf8 b27c b66c 0000 0df7 7fff ffff 0013 ed60 0200 0db5
3002260  0400 242d 0000 6e9f 0000 001b 0000 6e3f 0000 21cf 0000 315f 0000 0034 0013 ed2c b27c b66c 0000 0df8 7fff ffff 0013 ed94
3002340  0200 0db5 0400 242d 0000 6ea7 0000 000b 0000 6e3f 0000 21cf 0000 315f 0000 0034 0013 ed60 b27c b66c 0000 0df9 7fff ffff
3002420  0013 edc8 0200 0db5 0400 242d 0000 6ea7 0000 0013 0000 6e3f 0000 21cf 0000 315f 0000 0034 0013 ed94 b27c b66c 0000 0dfa
3002500  7fff ffff 0013 edfc 0200 0db5 0400 242d 0000 6eaf 0000 001b 0000 6e3f 0000 21cf 0000 315f 0000 0034 0013 edc8 b27c b66c
3002560  0000 0dfb 7fff ffff 0013 ee30 0200 0db5 0400 242d 0000 6eb7 0000 001b 0000 6e3f 0000 21cf 0000 315f 0000 0034 0013 edfc
3002640  b27c b66c 0000 0dfc 7fff ffff 0013 ee64 0200 0db5 0400 242d 0000 6eb7 0000 0023 0000 6e3f 0000 21cf 0000 315f 0000 0034
3002720  0013 ee30 b27c b66c 0000 0dfd 7fff ffff 0013 ee98 0200 0db5 0400 242d 0000 6eb7 0000 002b 0000 6e3f 0000 21cf 0000 315f
3003000  0000 0034 0013 ee64 b27c b66c 0000 0dfe 7fff ffff 0013 eecc 0200 0db5 0400 242d 0000 6eb7 0000 0033 0000 6e3f 0000 21cf
3003060  0000 315f 0000 0034 0013 ee98 b27c b66c 0000 0dff 7fff ffff 0013 ef00 0200 0db5 0400 242d 0000 2927 0000 000b 0000 6e3f
3003140  0000 21cf 0000 315f 0000 0034 0013 eecc b27c b66c 0000 0e00 7fff ffff 0013 ef34 0200 0db5 0400 242d 0000 6ebf 0000 0013
3003220  0000 6e3f 0000 21cf 0000 315f 0000 0034 0013 ef00 b27c b66c 0000 0e01 7fff ffff 0013 ef68 0200 0db5 0400 242d 0000 6ec7
3003300  0000 001b 0000 6e3f 0000 21cf 0000 315f 0000 0034 0013 ef34 b27c b66c 0000 0e02 7fff ffff 0013 ef9c 0200 0db5 0400 242d
3003360  0000 6ecf 0000 0013 0000 6e3f 0000 21cf 0000 315f 0000 0034 0013 ef68 b27c b66c 0000 0e03 7fff ffff 0013 efd0 0200 0db5
3003440  0400 242d 0000 6ed7 0000 001b 0000 6e3f 0000 21cf 0000 315f 0000 0034 0013 ef9c b27c b66c 0000 0e04 7fff ffff 0013 f004
3003520  0200 0db5 0400 242d 0000 6ed7 0000 0023 0000 6e3f 0000 21cf 0000 315f 0000 0034 0013 efd0 b27c b66c 0000 0e05 7fff ffff
3003600  0013 f038 0200 0db5 0400 242d 0000 6ed7 0000 002b 0000 6e3f 0000 21cf 0000 315f 0000 0034 0013 f004 b27c b66c 0000 0e06
3003660  7fff ffff 0013 f06c 0200 0db5 0400 242d 0000 6edf 0000 001b 0000 6e3f 0000 21cf 0000 315f 0000 0034 0013 f038 b27c b66c
3003740  0000 0e07 7fff ffff 0013 f0a0 0200 0db5 0400 242d 0000 6edf 0000 0023 0000 6e3f 0000 21cf 0000 315f 0000 0034 0013 f06c
3004020  b27c b66c 0000 0e08 7fff ffff 0013 f0d4 0200 0db5 0400 242d 0000 6edf 0000 002b 0000 6e3f 0000 21cf 0000 315f 0000 0034
3004100  0013 f0a0 b27c b66c 0000 0e09 7fff ffff 0013 f108 0200 0db5 0400 242d 0000 6ee7 0000 0013 0000 6e3f 0000 21cf 0000 315f
3004160  0000 0034 0013 f0d4 b27c b66c 0000 0e0a 7fff ffff 0013 f13c 0200 0db5 0400 242d 0000 6ee7 0000 001b 0000 6e3f 0000 21cf
3004240  0000 315f 0000 0034 0013 f108 b27c b66c 0000 0e0b 7fff ffff 0013 f170 0200 0db5 0400 242d 0000 6ee7 0000 002b 0000 6e3f
3004320  0000 21cf 0000 315f 0000 0034 0013 f13c b27c b66c 0000 0e0c 7fff ffff 0013 f1a4 0200 0db5 0400 242d 0000 2fdf 0000 000b
3004400  0000 6e3f 0000 21cf 0000 315f 0000 0034 0013 f170 b27c b66c 0000 0e0d 7fff ffff 0013 f1d8 0200 0db5 0400 242d 0000 6eef
3004460  0000 001b 0000 6e3f 0000 21cf 0000 315f 0000 0034 0013 f1a4 b27c b66c 0000 0e0e 7fff ffff 0013 f20c 0200 0db5 0400 242d
3004540  0000 6ef7 0000 001b 0000 6e3f 0000 21cf 0000 315f 0000 0034 0013 f1d8 b27c b66c 0000 0e0f 7fff ffff 0013 f240 0200 0db5
3004620  0400 242d 0000 6eff 0000 0013 0000 6e3f 0000 21cf 0000 315f 0000 0034 0013 f20c b27c b66c 0000 0e10 7fff ffff 0013 f274
3004700  0200 0db5 0400 242d 0000 6f07 0000 0013 0000 6e3f 0000 21cf 0000 315f 0000 0034 0013 f240 b27c b66c 0000 0e11 7fff ffff
3004760  0013 f2a8 0200 0db5 0400 242d 0000 6f0f 0000 001b 0000 6e3f 0000 21cf 0000 315f 0000 0034 0013 f274 b27c b66c 0000 0e12
3005040  7fff ffff 0013 f2dc 0200 0db5 0400 242d 0000 6f17 0000 0013 0000 6e3f 0000 21cf 0000 315f 0000 0034 0013 f2a8 b27c b66c
3005120  0000 0e13 7fff ffff 0013 f310 0200 0db5 0400 242d 0000 6f1f 0000 0023 0000 6e3f 0000 21cf 0000 315f 0000 0034 0013 f2dc
3005200  b27c b66c 0000 0e14 7fff ffff 0013 f344 0200 0db5 0400 242d 0000 6f1f 0000 002b 0000 6e3f 0000 21cf 0000 315f 0000 0034
3005260  0013 f310 b27c b66c 0000 0e15 7fff ffff 0013 f378 0200 0db5 0400 242d 0000 6f27 0000 0023 0000 6e3f 0000 21cf 0000 315f
3005340  0000 0034 0013 f344 b27c b66c 0000 0e16 7fff ffff 0013 f3ac 0200 0db5 0400 242d 0000 6f27 0000 002b 0000 6e3f 0000 21cf
3005420  0000 315f 0000 0034 0013 f378 b27c b66c 0000 0e17 7fff ffff 000a fdd0 0200 0db5 0400 242d 0000 3037 0000 000b 0000 6e3f
3005500  0000 21cf 0000 315f 0000 002c 0012 a8a4 b27c b66c 0000 0e19 7fff ffff 0013 c058 0200 0db5 0200 24bd 0000 6e3f 0000 31c7
3005560  0000 315f 000f 4c58 0000 0000 0013 f9cc 0000 057c b288 b66c 0000 0e18 7fff ffff 0013 f3e0 0200 0db5 0100 15ad 0100 33fd
3005640  0200 0b3d 0000 1f77 0000 000b 0000 315f 0013 f478 0000 0034 b288 b66c 0000 0e18 7fff ffff 0013 f414 0200 0db5 0100 15ad
3005720  0100 33fd 0200 0b3d 0000 1fd7 0000 000b 0000 315f 0013 f4ac 0000 0034 b288 b66c 0000 0e18 7fff ffff 0013 f448 0200 0db5
3006000  0100 15ad 0100 33fd 0200 0b3d 0000 1ff7 0000 000b 0000 315f 0013 f4e0 0000 0034 b288 b66c 0000 0e18 7fff ffff 0013 f47c
3006060  0200 0db5 0100 15ad 0100 33fd 0200 0b3d 0000 240f 0000 000b 0000 315f 0013 f514 0000 0034 b288 b66c 0000 0e18 7fff ffff
3006140  0013 f4b0 0200 0db5 0100 15ad 0100 33fd 0200 0b3d 0000 2c1f 0000 000b 0000 315f 0013 f548 0000 0034 b288 b66c 0000 0e18
3006220  7fff ffff 0013 f4e4 0200 0db5 0100 15ad 0100 33fd 0200 0b3d 0000 2edf 0000 000b 0000 315f 0013 f57c 0000 0034 b288 b66c
3006300  0000 0e18 7fff ffff 0013 f518 0200 0db5 0100 15ad 0100 33fd 0200 0b3d 0000 301f 0000 000b 0000 315f 0013 f5b0 0000 0034
3006360  b288 b66c 0000 0e18 7fff ffff 0013 f54c 0200 0db5 0100 15ad 0100 33fd 0200 0b3d 0000 309f 0000 0013 0000 315f 0013 f5e4
3006440  0000 0034 b288 b66c 0000 0e18 7fff ffff 0013 f580 0200 0db5 0100 15ad 0100 33fd 0200 0b3d 0000 28a7 0000 001b 0000 315f
3006520  0013 f618 0000 0034 b288 b66c 0000 0e18 7fff ffff 0013 f5b4 0200 0db5 0100 15ad 0100 33fd 0200 0b3d 0000 28a7 0000 0023
3006600  0000 315f 0013 f64c 0000 0034 b288 b66c 0000 0e18 7fff ffff 0013 f5e8 0200 0db5 0100 15ad 0100 33fd 0200 0b3d 0000 2ecf
3006660  0000 001b 0000 315f 0013 f680 0000 0034 b288 b66c 0000 0e18 7fff ffff 0013 f61c 0200 0db5 0100 15ad 0100 33fd 0200 0b3d
3006740  0000 2ecf 0000 0023 0000 315f 0013 f6b4 0000 0034 b288 b66c 0000 0e18 7fff ffff 0013 f650 0200 0db5 0100 15ad 0100 33fd
3007020  0200 0b3d 0000 28af 0000 001b 0000 315f 0013 f6e8 0000 0034 b288 b66c 0000 0e18 7fff ffff 0013 f684 0200 0db5 0100 15ad
3007100  0100 33fd 0200 0b3d 0000 28b7 0000 002b 0000 315f 0013 f71c 0000 0034 b288 b66c 0000 0e18 7fff ffff 0013 f6b8 0200 0db5
3007160  0100 15ad 0100 33fd 0200 0b3d 0000 28bf 0000 001b 0000 315f 0013 f750 0000 0034 b288 b66c 0000 0e18 7fff ffff 0013 f6ec
3007240  0200 0db5 0100 15ad 0100 33fd 0200 0b3d 0000 28c7 0000 001b 0000 315f 0013 f784 0000 0034 b288 b66c 0000 0e18 7fff ffff
```

```
3007320 0013 f720 0200 0db5 0100 15ad 0100 33fd 0200 0b3d 0000 28cf 0000 001b 0000 315f 0013 f7b8 0000 0034 b288 b66c 0000 0e18
3007400 7fff ffff 0013 f754 0200 0db5 0100 15ad 0100 33fd 0200 0b3d 0000 28d7 0000 001b 0000 315f 0013 f7ec 0000 0034 b288 b66c
3007460 0000 0e18 7fff ffff 0013 f788 0200 0db5 0100 15ad 0100 33fd 0200 0b3d 0000 28df 0000 001b 0000 315f 0013 f820 0000 0034
3007540 b288 b66c 0000 0e18 7fff ffff 0013 f7bc 0200 0db5 0100 15ad 0100 33fd 0200 0b3d 0000 28e7 0000 001b 0000 315f 0013 f854
3007620 0000 0034 b288 b66c 0000 0e18 7fff ffff 0013 f7f0 0200 0db5 0100 15ad 0100 33fd 0200 0b3d 0000 28ef 0000 001b 0000 315f
3007700 0013 f888 0000 0034 b288 b66c 0000 0e18 7fff ffff 0013 f824 0200 0db5 0100 15ad 0100 33fd 0200 0b3d 0000 28f7 0000 001b
3007760 0000 315f 0013 f8bc 0000 0034 b288 b66c 0000 0e18 7fff ffff 0013 f858 0200 0db5 0100 15ad 0100 33fd 0200 0b3d 0000 28ff
3010040 0000 001b 0000 315f 0013 f8f0 0000 0034 b288 b66c 0000 0e18 7fff ffff 0013 f88c 0200 0db5 0100 15ad 0100 33fd 0200 0b3d
3010120 0000 2907 0000 0023 0000 315f 0013 f924 0000 0034 b288 b66c 0000 0e18 7fff ffff 0013 f8c0 0200 0db5 0100 15ad 0100 33fd
3010200 0200 0b3d 0000 290f 0000 001b 0000 315f 0013 f958 0000 0034 b288 b66c 0000 0e18 7fff ffff 0013 f8f4 0200 0db5 0100 15ad
3010260 0100 33fd 0200 0b3d 0000 2917 0000 001b 0000 315f 0013 f9cc 0000 0034 b288 b66c 0000 0e18 7fff ffff 0013 f928 0200 0db5
3010340 0100 15ad 0100 33fd 0200 0b3d 0000 291f 0000 001b 0000 315f 000a 2588 0000 0000 0000 0000 000c b0a4 0000 0000 0000 0000
3010420 0000 0000 0019 92d1 000d c7c5 000a 25bc 0000 0000 000a 2604 0000 0000 0000 0000 0000 0000 000a 2614 0013 fb30 0000 0064
3010500 b27c b66c 0000 0e1a 0000 0e7b 000c 239c 0200 0db5 0500 1cdd 0000 2def 0000 000b 0000 6e3f 0051 2bc3 0000 03ab 0000 315f
3010560 0013 fb30 0000 002c b4f0 b4e4 0000 0e19 7fff ffff 0008 b0dd 0000 0000 0000 0000 0013 b604 0002 438a 0011 3674 0000 0000
3010640 000e 19e1 000c 4928 000c af8c 000a 1f1c 0000 0000 0011 4f10 0014 743c 000e 43f8 0000 0000 0000 0000 0000 0000 0000 0000
3010720 0000 0000 0000 0000 0000 0000 000e 1b95 000b 8998 000b adc8 000f 86ec 000c 01c9 0014 870c 0000 0000 0000 0000 000c 01f8
3011000 000a 1eec 0000 0000 0000 0000 0016 b165 0000 0000 0000 0000 0000 0000 0017 ee3c 0010 83dc 0000 0000 0000 0000 0000 0000
3011060 0000 0000 0000 0000 000d 6a0c 000d 6e80 0000 0000 0000 0000 000a 1efc 0000 0000 0000 0000 0018 a02d 000a 1f3c 000d c9e4
3011140 0016 439c 0000 0000 0000 0000 0000 0000 0000 0000 000f 8f68 0019 9369 000b 41ad 000c 0240 0000 0000 0000 0000 0000 0000
3011220 0000 0000 0000 0000 000a 1f2c 0013 fbd4 0000 0070 b27c b66c 0000 0e1e 0000 0e7e 0013 fb6c 0200 0db5 0500 1cdd 0000 2927
3011300 0000 000b 0000 6e3f 00a2 bde3 0000 03ab 0000 315f 0013 fbd4 0000 0038 b27c b66c 0000 0e1f 0000 0e7f 0013 fbd8 0200 0db5
3011360 0500 1cdd 0000 6f77 0000 001b 0000 6e3f 00a3 f043 0000 03ab 0000 315f 2c78 0032 0002 438a 2520 4740 34e0 0018 427c 0000
3011440 0000 000b 3640 41e8 0000 0003 24d0 0000 0014 7e58 0014 3d00 4a7c 000c 723c 7465 0013 fc70 0000 0038 b27c b66c 0000 0e20
3011520 0000 0e80 0013 fc74 0200 0db5 0500 1cdd 0000 6f77 0000 002b 0000 6e3f 00a3 f2c3 0000 03ab 0000 315f 28c4 0038 0013 fc40
3011600 56f8 6580 001c 92e4 001c 9a90 a3c8 001c aab4 0000 a3ec a8c8 001c aab4 00ff a538 3050 a874 aaf0 0001 ac4c 22bc 0014 7e58
3011660 2954 002c 0002 438a 56f8 6580 001c 92e4 001c 936c a874 aaf0 0001 ac4c 427c 0000 0000 0003 239c 0000 0014 7e58 0013 fcd4
3011740 0000 0038 b27c b66c 0000 0e21 0000 0e81 0013 fcd8 0200 0db5 0500 1cdd 0000 3037 0000 000b 0000 6e3f 00a2 e2a3 0000 03ab
3012020 0000 315f 2c78 002c 0002 438a 2520 3310 24d0 0000 0014 7ecc 0010 aa18 aab4 0000 a484 41d4 0000 0003 242c 0000 0014 7eec
3012100 0013 fd78 0000 0038 b27c b66c 0000 0e22 0000 0e82 0013 fd7c 0200 0db5 0500 1cdd 0000 6e8f 0000 0013 0000 6e3f 00a2 aca3
3012160 0000 03ab 0000 315f 2c78 0030 0002 438a 2520 46ec 3310 247c 0014 7ecc 0014 4210 0000 0003 3858 3d24 4240 0000 0000 0003
3012240 242c 0000 0014 7f28 0038 7e4e 2120 4e6f 2073 7472 696e 6773 2069 6e20 7468 6973 2076 6572 7369 6f6e 3b20 7573 6520 6174
3012320 6f6d 732e 7e6e 2120 476f 616c 3a20 7e71 7e6e 0073 0013 fde0 0000 0038 b27c b66c 0000 0e23 0000 0e83 0013 fde4 0200 0db5
3012400 0500 1cdd 0000 6e9f 0000 0013 0000 6e3f 00a2 b263 0000 03ab 0000 315f 2c78 0030 0002 438a 2520 442c 0200 6e9f 6b48 6b88
3012460 4568 6c34 5370 41e8 0000 6f9f 4300 0000 0000 328f 0008 c11c 000c c5a8 0013 fe58 0000 0070 b27c b66c 0000 0e24 0000 0e84
3012540 0013 fe5c 0200 0db5 0500 1cdd 0000 6e97 0000 0013 0000 6e3f 00a2 afa3 0000 03ab 0000 315f 0013 fe58 0000 0038 b27c b66c
3012620 0000 0e34 0000 0e94 0013 d5e0 0200 0db5 0500 1cdd 0000 6eaf 0000 001b 0000 6e3f 00a2 b7a3 0000 03ab 0000 315f 0018 7dd0
3012700 000a d75c 0013 ff20 0000 0070 b27c b66c 0000 0e25 0000 0e85 0013 fe94 0200 0db5 0500 1cdd 0000 6f57 0000 0013 0000 6e3f
3012760 00a3 f663 0000 03ab 0000 315f 0013 ff20 0000 0038 b27c b66c 0000 0e26 0000 0e86 0013 ff24 0200 0db5 0500 1cdd 0000 6f57
3013040 0000 000b 0000 6e3f 00a3 ffe3 0000 03ab 0000 315f 2954 0058 0002 438a 56f8 6840 69b0 9314 98c4 0010 320c 39f8 0014 808c
3013120 0014 2c88 0032 9314 9afc 0010 320c 39f8 0014 80ac 0014 2c88 001e 9314 9c10 0010 320c 39f8 0014 80cc 0014 2c88 000a 39f8
3013200 0014 80ec 0010 2340 0014 7ffc 0013 ff88 0000 0038 b27c b66c 0000 0e27 0000 0e87 0013 ff8c 0200 0db5 0500 1cdd 0000 6e8f
3013260 0000 001b 0000 6e3f 00a2 aea3 0000 03ab 0000 315f 2c78 0030 0002 438a 2520 4754 33a0 247c 0014 8118 0014 4210 0000 0003
3013340 3858 3d24 4240 0000 0000 0003 242c 0000 0014 7f28 0013 fff4 0000 0038 b27c b66c 0000 0e28 0000 0e88 0013 fff8 0200 0db5
3013420 0500 1cdd 0000 6e9f 0000 001b 0000 6e3f 00a2 b3e3 0000 03ab 0000 315f 2c78 0034 0002 438a 2520 442c 0300 6e9f 6b48 6b88
3013500 6bc8 4568 6c34 5370 4254 0000 0000 6f9f 4300 0000 0000 328f 0008 c11c 000c c5a8 0014 0098 0000 0070 b27c b66c 0000 0e29
3013560 0000 0e89 0014 0030 0200 0db5 0500 1cdd 0000 6e97 0000 001b 0000 6e3f 00a2 b163 0000 03ab 0000 315f 0014 0098 0000 0038
3013640 b27c b66c 0000 0e2a 0000 0e8a 0014 009c 0200 0db5 0500 1cdd 0000 6f67 0000 001b 0000 6e3f 00a4 08c3 0000 03ab 0000 315f
3013720 2954 0034 0002 438a 56f8 6868 6a00 4700 4740 247c 0014 7fdc 001c 3aa0 0014 81d0 0018 3804 3ba0 0000 0014 81f0 0010 2340
3014000 0014 801c 0014 0148 0000 0070 b27c b66c 0000 0e2b 0000 0e8b 0014 00d4 0200 0db5 0500 1cdd 0000 6f67 0000 0013 0000 6e3f
3014060 00a4 0f83 0000 03ab 0000 315f 0014 0148 0000 0038 b27c b66c 0000 0e2c 0000 0e8c 0014 014c 0200 0db5 0500 1cdd 0000 6f5f
3014140 0000 000b 0000 6e3f 00a4 0e83 0000 03ab 0000 315f 2c78 0040 0002 438a 45b8 9300 98c4 000a 320c 2340 0014 808c 9300 9afc
3014220 000c 320c 2420 0000 0014 80ac 9300 9c10 000c 320c 2420 0000 0014 80cc 2420 0000 0014 80ec 0014 0248 0000 0038 b27c b66c
3014300 0000 0e2d 0000 0e8d 0014 024c 0200 0db5 0500 1cdd 0000 6e87 0000 001b 0000 6e3f 00a2 aaa3 0000 03ab 0000 315f 2c78 00c6
3014360 0002 438a 45c4 4728 0024 4790 0020 9314 98c4 001a 382c 0020 4568 6e1c 0024 5370 4538 6d50 6bf4 234c 0014 5594 9350 0020
```

```
3014440  98c4 008e 9350 0024 97f4 0020 3364 3c9c 0000 0024 0014 57dc 0028 32f0 001c 247c 0014 801c 0028 2c88 0022 37c4 0024 31bc
3014520  4a7c 0018 4268 0000 0000 000b 3380 001c 3c48 0000 0014 7e08 0024 247c 0014 7fdc 0024 3348 3af4 0020 0014 808c 0020 aa50
3014600  aa88 001c 9db0 a164 3d78 3d3c 3b4c 0000 0014 7e38 0014 4210 0000 0003 385d 37dc 4240 0000 0000 0003 242c 0000 0014 7f28
3014660  c5a8 7061 0014 04c0 0000 0038 b27c b66c 0000 0e2e 0000 0e8e 0014 04c4 0200 0db5 0500 1cdd 0000 6eef 0000 001b 0000 6e3f
3014740  00a2 d123 0000 03ab 0000 315f 27f0 0058 0014 02d4 45dc 4700 4754 9314 936c 933c 9860 9328 9860 3050 24d0 0000 0014 7fdc
3015020  001c 320c 3c48 0000 0014 808c 0018 3310 3bf4 0000 0014 808c 0014 4210 0000 0003 3858 3d24 4240 0000 0000 0003 242c 0000
3015100  0014 7f28 28c4 0188 0014 045c 45e8 001c 4714 4740 9300 9860 3380 0020 3b4c 0000 0014 5b5c 0024 9350 001c 98c4 00aa 332c
3015160  3af4 001c 0014 5b5c 0024 933c 98c4 004e 3348 3aa0 0014 5b5c 0024 2ecc aa88 0020 aa34 9db0 af5c 4290 0000 0018 0000 0003
3015240  38fc 001c 3858 41e8 0000 0003 3b4c 0000 0014 82c4 0024 4290 0000 0018 0000 0003 38e8 3d6c 3d30 2340 0014 82c4 933c 93a8
3015320  0044 2ecc aa88 0020 aa34 9db0 adec 4290 0000 0018 0000 0003 38fc 001c 3858 41e8 0000 0003 3b4c 0000 0014 82c4 0024 4290
3015400  0000 0018 0000 0003 38e8 386c 3d30 2340 0014 82e4 c5a8 9350 001c 93a8 00ae 933c 98c4 004e 2ecc 3348 3c48 0000 0014 5b5c
3015460  0024 aa88 0020 aa50 9db0 ada8 4224 0018 0000 0003 38e8 386c 37f0 39a4 0014 82c4 0024 4290 0000 0018 0000 0003 38fc 001c
3015540  3858 41e8 0000 0003 2420 0000 0014 82e4 933c 93a8 0054 2ecc 33bc 382c 0020 42ac 0000 0003 0014 8304 0024 a388 0020 aa34
3015620  94b0 adec 4224 0018 0000 0003 38fc 001c 3858 41e8 0000 0003 3b4c 0000 0014 82e4 001c 4290 0000 0018 0000 0003 38e8 386c
3015700  3d30 2340 0014 82e4 c5a8 c5a8 2954 0060 0002 438a 45d0 46d8 3588 332c 5d7c 0000 0300 6eef 6d94 6d0c 6b48 9328 98c4 001a
3015760  9300 98c4 0014 3d60 4254 0000 0000 001b 242c 0000 0038 cebc 3858 41e8 0000 000b 3bf4 0000 0008 cebc 0014 3d60 4254 0000
3016040  0000 0013 2420 0000 0008 cebc 0014 05dc 0000 0070 b27c b66c 0000 0e2f 0000 0e8f 0014 04fc 0200 0db5 0500 1cdd 0000 6f07
3016120  0000 0013 0000 6e3f 00a2 d6e3 0000 03ab 0000 315f 0014 05dc 0000 0038 b27c b66c 0000 0e30 0000 0e90 0014 05e0 0200 0db5
3016200  0500 1cdd 0000 6ef7 0000 001b 0000 6e3f 00a2 d323 0000 03ab 0000 315f 27f0 006c 0014 0598 45b8 46ec 4768 9314 9860 2ba0
3016260  0020 002c 9300 9a90 3050 3410 001c 37f0 3b4c 0300 0014 839c 0020 aa88 001c aab4 0000 a3ec 3df4 001c 4a7c 0014 723c 2c58
3016340  9300 936c 2ecc 3364 3ba0 0000 0014 5b5c 001c 3844 3d48 42ac 0000 000b 0014 8304 0018 231c 0014 839c 2954 0040 0002 438a
3016420  2520 46d8 332c 5b58 0300 6ef7 6b48 6d0c 6bc8 9300 98c4 0012 3d60 41e8 0000 000b 242c 0000 0008 cdfc 3d60 41e8 0000 0013
3016500  2420 0000 0008 cebc 0014 0664 0000 0038 b27c b66c 0000 0e31 0000 0e91 0014 0760 0200 0db5 0500 1cdd 0000 6ec7 0000 001b
3016560  0000 6e3f 00a2 c063 0000 03ab 0000 315f 27f0 0050 0013 e4e4 3724 001c 92a8 9860 92e4 001c 9860 3050 4224 0028 ffff fffb
3016640  4224 0024 ffff fffb 4224 0020 0000 0003 4224 0018 ffff fffb 427c 0000 ffff fffb 4268 0000 0000 0003 239c 0000 0014 899c
3016720  0014 075c 0000 0030 0014 8550 0000 0000 0014 83ac 0000 0000 0014 8764 0014 8815 0014 8864 000a 25d9 0014 836c 0000 0000
3017000  27f0 0088 0014 0718 45b8 4700 477c 9328 9860 2ba0 0024 0034 9300 9a90 3050 aa18 aaf0 0001 ada8 3410 0020 3804 3ba0 0000
3017060  0014 839c 0024 aa88 0020 aab4 0000 a3ec 3df4 0020 4a7c 0018 723c 2c58 9300 936c 2ecc 3380 001c 3a4c 0014 5b5c 0020 33bc
3017140  3e70 001c 4300 0000 0000 000b 0014 8304 001c 3880 3804 39f8 0014 839c 0014 aa34 aaf0 ffff af34 723c 2954 0040 0002 438a
3017220  2520 46d8 332c 5b58 0300 6ec7 6b48 6d0c 6bc8 9300 98c4 0012 3d60 41e8 0000 000b 242c 0000 0008 cdfc 3d60 41e8 0000 0013
3017300  2420 0000 0008 cebc 0014 0800 0000 0038 b27c b66c 0000 0e32 0000 0e92 0014 0804 0200 0db5 0500 1cdd 0000 6e77 0000 0013
3017360  0000 6e3f 00a2 a623 0000 03ab 0000 315f 2c78 006a 0002 438a 45b8 46ec 9300 9afc 0018 aa18 aab4 0001 a3ec aa18 aab4 00ff
3017440  a538 2330 0014 83f4 9314 9460 0018 37dc 3ba0 0000 0014 8414 0014 aa18 aab4 0000 a3ec 22a0 9300 93a8 0020 3844 4254 0000
3017520  0000 07fb 4300 0000 0000 000b 0014 8304 0014 2330 0014 83f4 c5a8 5f72 0014 147c 0000 0038 b27c b66c 0000 0e33 0000 0e93
3017600  0013 fe1c 0200 0db5 0500 1cdd 0000 6f2f 0000 001b 0000 6e3f 00a4 1823 0000 03ab 0000 315f 2c78 0048 0002 438a 45d0 46d8
3017660  4754 aa50 aa18 a1d0 000a 379c 4a7c 0010 723c aa50 aa18 a354 2ba0 0018 000a 379c 4a7c 0010 723c 2c58 aa50 aaf0 0001 ac08
3017740  3858 37dc 242c 0000 0014 8304 0000 75af b328 2944 0015 6584 0000 0000 0012 6461 7461 5f70 726f 7869 6d69 7479 5f61 7578
3020020  0000 17a7 0011 5498 0300 6c97 0000 3287 0000 000c 0013 a8d4 0013 a8d4 0001 0072 0000 0000 0011 4f70 0300 6c9f 0000 3287
3020100  0000 000c 0014 08e4 0014 08e4 0001 0072 0000 0000 2c78 0024 0002 438a 2520 4740 33bc 247c 0013 e854 0014 abb8 3f80 0000
3020160  aa34 9db0 af34 723c 0012 7363 6865 6475 6c65 5f70 726f 7869 6d69 7479 0014 0905 0011 4fe4 0300 6ca7 0000 3287 0000 000c
3020240  0013 a978 0013 a978 0001 0072 0000 0000 0011 503c 0300 6caf 0000 3287 0000 000c 0014 09d8 0014 09d8 0001 0072 0000 0000
3020320  0011 7363 6865 6475 6c65 5f64 6973 7461 6e63 6500 0011 506c 0300 6cb7 0000 3287 0000 000c 0014 09b4 0014 09b4 0001 0072
3020400  0000 0000 0014 0a68 0400 6ccf 0000 3287 0000 0010 0014 0abc 0014 0abc 0001 0072 0000 0000 2c78 0024 0002 438a 2520 4740
3020460  33bc 247c 0014 0930 0014 abb8 3f80 0000 aa34 9db0 af34 723c 2c78 0022 0002 438a 2520 4740 33bc 247c 0014 0a0c 0014 aab4
3020540  0001 aa34 9db0 af34 723c 0a01 0012 004c 0300 6cbf 0000 3287 0000 000c 0013 aa58 0013 aa58 0001 0072 0000 0000 0010 696e
3020620  635f 6469 7374 616e 6365 5f61 7578 00a7 0011 50c8 0300 6cc7 0000 3287 0000 000c 0013 ab18 0013 ab18 0001 0072 0000 0000
3020700  0014 696e 636f 6170 6174 6962 696c 6974 795f 636f 7374 004d 0011 5120 0300 6ccf 0000 3287 0000 000c 0013 abe4 0013 abe4
3020760  0001 0072 0000 0000 0011 5198 0200 6cd7 0000 3287 0000 0008 0018 ab60 0018 ab60 0041 0000 0000 0000 27f0 0014 0013 ac6c
3021040  4e1c 0000 0000 0007 49c8 2edc 2cac 0ac5 0002 438a 2ca0 0ad7 0000 0000 0000 0001 0014 0aa8 0014 0b00 000d 4d08 000b 4ed8
3021120  0011 5230 0200 6cdf 0000 3287 0000 0008 0014 0b28 0014 0b28 0001 0072 0000 0000 2954 0014 0002 438a 56f8 5fa0 671c 22bc
3021200  0014 09a4 0010 696e 636f 6d70 6174 6962 6c65 5f6f 7073 0042 2c78 0024 0002 438a 45b8 3050 3228 329c 24d0 0000 000d d604
3021260  0014 3d30 2420 0000 0014 0b5c 0011 52e8 0200 6ce7 0000 3287 0000 0008 0014 0b98 0014 0b98 0001 0072 0000 0000 0011 7361
3021340  6d65 5f63 6f6e 7472 6f6c 5f73 7465 7000 0013 7361 6d65 5f6f 7065 7261 7469 6f6e 5f74 7970 6500 52ed 2c78 001c 0002 438a
3021420  45b8 46ec 37f0 39a4 0014 0bc4 0014 2330 0014 0be4 0011 5334 0200 6cef 0000 3287 0000 0008 0014 0bf4 0014 0bf4 0001 0072
3021500  0000 0000 0011 5384 0200 6cf7 0000 3287 0000 0008 0013 ad94 0013 ad94 0001 0072 0000 0000 2c78 0024 0002 438a 2520 46d8
```

```
3021560  3228 332c 24d0 0000 0012 f02c 0014 3228 3d30 2340 0012 f02c 0012 6573 7469 6d61 7465 5f72 6567 6973 7465 7273 0008 af5d
3021640  0015 6f70 6572 6174 6f72 5f6f 7063 6f64 655f 7479 7065 7300 0013 372c 0600 6d4f 0000 3287 0000 0018 0013 c9cc 0013 c9cc
3021720  0001 0073 0000 0000 0011 57c8 0200 6d57 0000 3287 0000 0008 0015 b364 0015 b364 0001 0074 0000 0000 0014 0c48 0300 6d4f
3022000  0000 3287 0000 000c 0013 cb80 0013 cb80 0001 0073 0000 0000 0014 0c88 0200 6d4f 0000 3287 0000 0008 0013 cbf4 0013 cbf4
3022060  0001 0073 0000 0000 0019 6573 7469 6d61 7465 5f6d 7578 6573 5f66 6f72 5f6f 705f 6964 7300 0011 5918 0200 616f 0000 3287
3022140  0000 0008 0013 ccc4 0013 ccc4 0001 0073 0000 0000 0011 5938 0300 6d77 0000 3287 0000 000c 0014 0d38 0013 cd30 0001 0073
3022220  0000 0000 2938 0014 0014 0d5c 4e1c 0000 0000 0003 54f8 228c 27f0 0d21 0013 cd30 2ca0 17a7 0000 000c 0000 0004 0014 0d24
3022300  0013 cd30 0002 438a 0012 c954 28c4 0014 0014 0170 4e1c 0000 0000 000b 54f8 228c 28c4 0014 0014 0d84 4e1c 0000 0000 0013
3022360  54f8 228c 28c4 0026 0013 cd30 4e1c 0000 0000 001b 57b8 671c 5370 5aec 0200 6d7f 6b88 4af8 0000 0013 228c 0dca 000e 6573
3022440  7469 6d61 7465 5f6d 7578 6573 0000 00a3 0011 5974 0200 6d87 0000 3287 0000 0008 0014 0de0 0014 0de0 0001 0073 0000 0000
3022520  2c78 0020 0002 438a 2520 46ec 3310 247c 000b 4af4 0014 37f0 3cf4 234c 0014 0cf4 0013 6573 7469 6d61 7465 645f 7265 6769
3022600  7374 6572 7300 04fd 0011 59d0 0300 6d8f 0000 3287 0000 000c 000a 18f0 0002 438a 0003 0073 0000 0000 0014 0f14 0200 6daf
3022660  0000 3287 0000 0008 0014 0f48 0014 0f48 0001 0073 0000 0000 000f 6573 7469 6d61 7465 645f 6d75 7865 7300 0023 0011 5aa8
3022740  0300 6d97 0000 3287 0000 000c 000a 18f0 0002 438a 0003 0073 0000 0000 000e 6573 7469 6d61 7465 645f 7369 7a65 0013 602d
3023020  0011 5ac8 0200 619f 0000 3287 0000 0008 000a 18f0 0002 438a 0003 0073 0000 0000 000f 636c 6561 725f 6573 7469 6d61 7465
3023100  7300 0ed9 0011 5ae8 0000 6da7 0000 3287 0000 0000 0013 ce90 0013 ce90 0001 0073 0000 0000 001d 6573 7469 6d61 7465 5f72
3023160  6567 6973 7465 7273 5f66 6f72 5f64 6573 6967 6e00 0011 5b08 0300 6daf 0000 3287 0000 000c 0013 cfc0 0013 cfc0 0001 0073
3023240  0000 0000 27f0 0014 0014 0f6c 4e1c 0000 0000 0007 54a8 2edc 2cac 17a7 0002 438a 2ca0 005b 0000 0000 0000 0001 0014 0f34
3023320  0014 0f6c 0014 0f76 000b 5218 2954 c028 0002 438a 56f8 671c 682c 5758 6750 6a00 24d0 0000 0014 0cb8 0014 2ecc 2410 0000
3023400  0014 0e48 0019 6573 7469 6d61 7465 5f6d 7578 6573 5f66 6f72 5f64 6573 6967 6e00 0011 5b7c 0300 6db7 0000 3287 0000 000c
3023460  0013 d138 0013 d138 0001 0073 0000 0000 0014 0fb0 0200 6db7 0000 3287 0000 0008 0014 1080 0014 1080 0001 0073 0000 0000
3023540  0011 5bcc 0200 6dbf 0000 3287 0000 0008 0014 1024 0014 1024 0001 0073 0000 0000 27f0 0014 0014 1048 4e1c 0000 0000 0007
3023620  54a8 228c 2cac 100d 0002 438a 2ca0 17a7 0000 0000 0000 0001 0014 1010 0014 1048 0014 1052 0011 2860 2954 0024 0002 438a
3023700  56f8 671c 682c 5758 6750 6a00 24d0 0000 0008 c83c 0014 2330 0014 1000 27f0 0014 0014 10a4 4e1c 0000 0000 0007 54a8 2edc
3023760  2cac 109c 0002 438a 2ca0 1071 0000 0000 0000 0001 0014 106c 0014 10a4 0014 10ae 000b 5328 2954 0028 0002 438a 56f8 671c
3024040  682c 5758 6750 6a00 24d0 0000 0014 0dd0 0014 2ecc 2410 0000 0014 0fe0 0014 6573 7469 6d61 7465 735f 666f 725f 6465 7369
3024120  676e 00e9 001a 6173 7365 7274 5f65 7374 696d 6174 6564 5f72 6567 6973 7465 7273 0014 1109 0016 6173 7365 7274 5f65 7374
3024200  696d 6174 6564 5f6d 7578 6573 0000 00cb 0011 5c8c 0300 6dc7 0000 3287 0000 000c 0013 d210 0013 d210 0001 0073 0000 0000
3024260  0011 5dd4 0300 61cf 0000 3287 0000 000c 0013 d28c 0013 d28c 0001 0073 0000 0000 0011 5e6c 0300 6dd7 0000 3287 0000 000c
3024340  0013 d30c 0013 d30c 0001 0073 0000 0000 0015 6573 7469 6d61 7465 735f 666f 725f 6465 7369 676e 7300 0011 5ea8 0000 6ddf
3024420  0000 3287 0000 0000 0014 11b8 0014 11b8 0001 0073 0000 0000 2c78 0020 0002 438a 2520 3280 24d0 0000 0014 11e8 0010 3cf4
3024500  242c 0000 0014 1208 0011 5f18 0100 6de7 0000 3287 0000 0004 0015 441c 0015 441c 0001 0074 0000 0000 0014 1198 0100 6ddf
3024560  0000 3287 0000 0004 0014 122c 0014 122c 0001 0073 0000 0000 27f0 0012 0013 d420 4e1c 0000 0000 0007 228c 1231 2cac 124e
3024640  0002 438a 2ca0 121d 0000 0000 0000 0001 0014 1218 0013 d420 0013 d42a 0011 28c8 000e 6675 735f 666f 725f 6465 7369 676e
3024720  0000 17a7 0011 2020 2020 2044 6573 6967 6e20 7e77 3a7e 6e00 0024 2020 2020 2020 2020 4c69 7374 206f 6620 6675 6e63 7469
3025000  6f6e 2075 6e69 7473 207e 772e 7e6e 0079 0013 3398 0200 6def 0000 3287 0000 0008 0014 12e4 0014 12e4 0001 0073 0000 0000
3025060  000c 4b40 0000 0000 0005 696e 6465 7800 27f0 0014 0014 1320 4e1c 0000 0000 0007 54a8 228c 2cac 17a7 0002 438a 2ca0 013b
3025140  0000 0000 0000 0001 0014 12d0 0014 1320 0014 132a 0011 293c 0012 636c 7573 7465 725f 6f70 6572 6174 696f 6e73 0014 1305
3025220  2954 0024 0002 438a 56f8 671c 682c 5758 6750 6a00 24d0 0000 0014 1354 0014 2330 0014 12b0 0011 61dc 0200 6e17 0000 3287
3025300  0000 0008 0015 b334 0015 b334 0001 0074 0000 0000 0013 7265 636f 7264 5f64 6573 6967 6e5f 7369 7a65 7300 1396 0011 6238
3025360  0200 6e1f 0000 3287 0000 0008 0014 13b0 0014 13b0 0001 0073 0000 0000 27f0 0014 0013 d590 4e1c 0000 0000 0007 54a8 228c
3025440  2cac 016b 0002 438a 2ca0 13da 0000 0000 0000 0001 0014 139c 0013 d590 0013 d59a 0011 29f4 0015 6173 7365 7274 5f65 7374
3025520  696d 6174 6564 5f73 697a 6500 0011 6258 0200 6e27 0000 3287 0000 0008 0013 d610 0013 d610 0001 0073 0000 0000 0000 002c
3025600  0015 635c b27c b66c 0000 0f7e 7fff ffff 0014 3518 0200 0db5 0200 2f35 0000 6d47 0000 03bb 0000 315f 0000 002c 0015 6818
3025660  b27c b66c 0000 0fa7 7fff ffff 0013 e8b8 0200 0db5 0200 224d 0000 6d47 0000 3287 0000 315f 2c78 0012 0002 438a 4e1c 0000
3025740  0000 75ff 228c 0000 0014 17b0 0000 0090 b27c b66c 0000 0f80 0000 0fa6 000a d16d 0200 0db5 0200 270d 0000 6d47 0000 3287
3026020  0000 315f 0014 14e0 0000 0038 b27c b66c 0000 0f81 0000 0fa8 0014 17b4 0200 0db5 0500 1cd1 0000 72ff 0000 001b 0000 3287
3026100  00ad 98a3 0000 03bb 0000 315f 0014 17b0 0000 002c b4f0 b4e4 0000 0f80 7fff ffff 0008 b0dd 0000 0000 0000 0000 0014 1908
3026160  0002 438a 0015 bcf4 0000 0038 0014 177c b27c b66c 0000 0f82 7fff ffff 0014 1574 0200 0db5 0300 72fd 0000 0001 0000 0ab7
3026240  0000 0007 0000 746f 0000 7477 0000 315f 0000 002c 0014 1548 b4f0 b4e4 0000 0f81 7fff ffff 0015 b315 0000 0000 0000 0000
3026320  0014 1510 0015 3f80 0015 bca4 0000 0038 0014 1510 b27c b66c 0000 0f83 7fff ffff 0014 15ac 0200 0db5 0300 72fd 0000 0001
3026400  0000 0ad7 0000 0007 0000 747f 0000 7487 0000 315f 0000 0038 0014 1574 b27c b66c 0000 0f84 7fff ffff 0014 15e4 0200 0db5
3026460  0300 72fd 0000 0001 0000 0a87 0000 0007 0000 748f 0000 7497 0000 315f 0000 0040 0014 15ac b27c b66c 0000 0f85 7fff ffff
3026540  0014 1624 0200 0db5 0300 72fd 0000 0001 0000 0ab7 0000 0001 0000 0ad7 0000 0007 0000 749f 0000 74a7 0000 315f 0000 0040
3026620  0014 15e4 b27c b66c 0000 0f86 7fff ffff 0014 1664 0200 0db5 0300 72fd 0000 0001 0000 0ad7 0000 0001 0000 0ab7 0000 0007
```

```
3026700  0000 749f 0000 74a7 0000 315f 0000 0038 0014 1624 b27c b66c 0000 0f87 7fff ffff 0014 169c 0200 0db5 0300 72fd 0000 0001
3026760  0000 0df7 0000 0007 0000 74af 0000 74b7 0000 315f 0000 0038 0014 1664 b27c b66c 0000 0f88 7fff ffff 0014 16d4 0200 0db5
3027040  0300 72fd 0000 0001 0000 54b7 0000 0007 0000 74af 0000 74b7 0000 315f 0000 0038 0014 169c b27c b66c 0000 0f89 7fff ffff
3027120  0014 170c 0200 0db5 0300 72fd 0000 0001 0000 04e7 0000 0007 0000 74af 0000 74b7 0000 315f 0000 0038 0014 16d4 b27c b66c
3027200  0000 0f8a 7fff ffff 0014 1744 0200 0db5 0300 72fd 0000 0001 0000 54bf 0000 0007 0000 74af 0000 74b7 0000 315f 0000 0038
3027260  0014 170c b27c b66c 0000 0f8b 7fff ffff 0014 177c 0200 0db5 0300 72fd 0000 0001 0000 0e27 0000 0007 0000 74af 0000 74b7
3027340  0000 315f 0000 0038 0014 1744 b27c b66c 0000 0f8c 7fff ffff 0014 1549 0200 0db5 0300 72fd 0000 0001 0000 0e2f 0000 0007
3027420  0000 74af 0000 74b7 0000 315f 0014 1904 0000 0038 b27c b66c 0000 0f8d 0000 0fa9 0014 1908 0200 0db5 0500 1cdd 0000 72d7
3027500  0000 001b 0000 3287 00ad 9123 0000 03bb 0000 315f 0000 0030 0014 18d8 b27c b66c 0000 0f8e 7fff ffff 0014 1849 0200 0db5
3027560  0300 72d5 0000 000b 0000 5357 0000 74bf 0000 315f 0000 002c 0014 181c b4f0 b4e4 0000 0f8d 7fff ffff 0015 b225 0000 001c
3027640  0000 0005 0014 17ec 0002 438a 0015 bca8 0000 0030 0014 17ec b27c b66c 0000 0f8f 7fff ffff 0014 1878 0200 0db5 0300 72d5
3027720  0000 0023 0000 5357 0000 74c7 0000 315f 0000 0030 0014 1848 b27c b66c 0000 0f90 7fff ffff 0014 18a8 0200 0db5 0300 72d5
3030000  0000 0043 0000 5357 0000 74cf 0000 315f 0000 0030 0014 1878 b27c b66c 0000 0f91 7fff ffff 0014 18d8 0200 0db5 0300 72d5
3030060  0000 0083 0000 5357 0000 74d7 0000 315f 0000 0030 0014 18a8 b27c b66c 0000 0f92 7fff ffff 0014 181d 0200 0db5 0300 72d5
3030140  0000 0103 0000 5357 0000 74df 0000 315f 0014 1cdc 0000 0038 b130 b66c 0000 0f93 0000 0faa 0014 14e5 0200 0db5 0500 1cdd
3030220  0000 72ef 0000 0023 0000 3287 00ad 9543 0000 03bb 0300 315f 0000 0034 0014 1cac b27c b66c 0000 0f94 7fff ffff 0014 19a0
3030300  0200 0db5 0400 72ed 0000 0083 0000 0013 0000 6d7f 0000 74e7 0000 315f 0000 002c 0014 1974 b4f0 b4e4 0000 0f93 7fff ffff
3030360  0015 b2a9 0000 0005 0000 0001 0014 1940 0002 438a 0015 bb4c 0000 0034 0014 1940 b27c b66c 0000 0f95 7fff ffff 0014 19d4
3030440  0200 0db5 0400 72ed 0000 0083 0000 001b 0000 6d7f 0000 74ef 0000 315f 0000 0034 0014 19a0 b27c b66c 0000 0f96 7fff ffff
3030520  0014 1a08 0200 0db5 0400 72ed 0000 0083 0000 0023 0000 6d7f 0000 74f7 0000 315f 0000 0034 0014 19d4 b27c b66c 0000 0f97
3030600  7fff ffff 0014 1a3c 0200 0db5 0400 72ed 0000 0083 0000 002b 0000 6d7f 0000 74ff 0000 315f 0000 0034 0014 1a08 b27c b66c
3030660  0000 0f98 7fff ffff 0014 1a70 0200 0db5 0400 72ed 0000 0083 0000 0033 0000 6d7f 0000 7507 0000 315f 0000 0034 0014 1a3c
3030740  b27c b66c 0000 0f99 7fff ffff 0014 1aa4 0200 0db5 0400 72ed 0000 0083 0000 003b 0000 6d7f 0000 750f 0000 315f 0000 0034
3031020  0014 1a70 b27c b66c 0000 0f9a 7fff ffff 0014 1ad8 0200 0db5 0400 72ed 0000 0083 0000 0043 0000 6d7f 0000 7517 0000 315f
3031100  0000 0034 0014 1aa4 b27c b66c 0000 0f9b 7fff ffff 0014 1b0c 0200 0db5 0400 72ed 0000 0083 0000 004b 0000 6d7f 0000 751f
3031160  0000 315f 0000 0034 0014 1ad8 b27c b66c 0000 0f9c 7fff ffff 0014 1b40 0200 0db5 0400 72ed 0000 0083 0000 0053 0000 6d7f
3031240  0000 7527 0000 315f 0000 0034 0014 1b0c b27c b66c 0000 0f9d 7fff ffff 0014 1b74 0200 0db5 0400 72ed 0000 0083 0000 005b
3031320  0000 6d7f 0000 752f 0000 315f 0000 0034 0014 1b40 b27c b66c 0000 0f9e 7fff ffff 0014 1ba8 0200 0db5 0400 72ed 0000 0083
3031400  0000 0063 0000 6d7f 0000 7537 0000 315f 0000 0034 0014 1b74 b27c b66c 0000 0f9f 7fff ffff 0014 1bdc 0200 0db5 0400 72ed
3031460  0000 0083 0000 006b 0000 6d7f 0000 753f 0000 315f 0000 0034 0014 1ba8 b27c b66c 0000 0fa0 7fff ffff 0014 1c10 0200 0db5
3031540  0400 72ed 0000 0083 0000 0073 0000 6d7f 0000 7547 0000 315f 0000 0034 0014 1bdc b27c b66c 0000 0fa1 7fff ffff 0014 1c44
3031620  0200 0db5 0400 72ed 0000 0083 0000 007b 0000 6d7f 0000 754f 0000 315f 0000 0034 0014 1c10 b27c b66c 0000 0fa2 7fff ffff
3031700  0014 1c78 0200 0db5 0400 72ed 0000 0083 0000 0083 0000 6d7f 0000 7557 0000 315f 0000 0034 0014 1c44 b27c b66c 0000 0fa3
3031760  7fff ffff 0014 1cac 0200 0db5 0400 72ed 0000 0083 0000 008b 0000 6d7f 0000 755f 0000 315f 0000 0034 0014 1c78 b27c b66c
3032040  0000 0fa4 7fff ffff 0014 1975 0200 0db5 0400 72ed 0000 0083 0000 0093 0000 6d7f 0000 7567 0000 315f 0014 3444 0000 173c
3032120  6361 6c6c 5f63 6869 7073 697a 6572 2862 6174 6368 2c20 4444 4c46 696c 652c 2046 444c 4669 6c65 2920 3a2d 0a09 7772 6974
3032200  6528 2720 2020 2020 4578 6563 7574 696e 6720 4368 6970 5369 7a65 7228 746d 292e 2729 2c6e 6c2c 0a09 280a 0920 2020 2073
3032260  7973 7465 6d28 5b27 6368 6970 7369 7a65 7220 2162 7269 6566 202d 7061 7468 2060 7077 6460 202d 6620 272c 2046 444c 4669
3032340  6c65 2c20 2720 2170 6174 6820 272c 0a09 2020 2020 0920 2020 2027 2024 6420 272c 2044 444c 4669 6c65 2c20 2720 3e20 2f64
3032420  6576 2f6e 756c 6c27 5d29 2c21 2c0a 0920 2020 2077 7269 7465 2827 2020 2020 2043 6869 7053 697a 6572 2063 6f6d 706c 6574
3032500  6564 2073 7563 6365 7373 6675 6c6c 792e 2729 2c6e 6c2c 6e6c 0a09 3b0a 0920 2020 206e 6c2c 2077 7269 7465 2827 2020 2020
3032560  2045 7272 6f72 206f 6363 7572 7265 6420 7768 696c 6520 6578 6563 7574 696e 6720 4368 6970 5369 7a65 722e 2729 2c6e 6c2c
3032640  6e6c 2c0a 0920 2020 2066 6169 6c0a 0929 2e0a 6361 6c6c 5f63 6869 7073 697a 6572 2869 6e74 6572 6163 7469 7665 2c20 4444
3032720  4c46 696c 652c 2046 444c 4669 6c65 2920 3a2d 0a09 7772 6974 6528 2720 2020 2020 4578 6563 7574 696e 6720 4368 6970 5369
3033000  7a65 7228 746d 292e 2729 2c6e 6c2c 0a09 280a 0920 2020 2073 7973 7465 6d28 5b27 6368 6970 7369 7a65 725f 6720 2d70 6174
3033060  6820 6070 7764 6020 2d66 2027 2c20 4644 4c46 696c 652c 2027 202d 7061 7468 2027 2c0a 0920 2020 2009 2020 2020 2720 2d64
3033140  2027 2c20 4444 4c46 696c 652c 2027 203e 202f 6465 762f 6e75 6c6c 275d 292c 212c 0a09 2020 2020 7772 6974 6528 2720 2020
3033220  2020 4368 6970 5369 7a65 7220 636f 6d70 6c65 7465 6420 7375 6363 6573 7366 756c 6c79 2e27 292c 6e6c 2c6e 6c0a 093b 0a09
3033300  2020 2020 6e6c 2c20 7772 6974 6528 2720 2020 2020 4572 726f 7220 6f63 6375 7272 6564 2077 6869 6c65 2065 7865 6375 7469
3033360  6e67 2043 6869 7053 697a 6572 2e27 292c 6e6c 2c6e 6c2c 0a09 2020 2020 6661 696c 0a09 292e 0a0a 2525 2525 2525 2525 2525
3033440  2525 2525 2525 2525 2525 2525 2525 2525 2525 2525 2525 2525 2525 2525 2525 2525 2525 2525 2525 2525 2525 2525 2525 2525
3033520  2525 2525 2525 2525 2525 2525 2525 2525 2525 2525 0a75 7829 203a 2d0a 0967 6574 6462 5f63 7572 7265 6e74 2863 6869 7073
3033600  697a 6572 5f64 646c 5f66 696c 655f 7374 7265 616d 2c20 5374 7265 616d 292c 0a09 2525 2042 6567 696e 2066 756e 6374 696f
3033660  6e0a 0977 7269 7465 5f62 6567 696e 5f66 756e 2853 7472 6561 6d2c 2046 756e 6374 696f 6e29 2c0a 0925 2520 5772 6974 6520
3033740  636c 7573 7465 720a 0977 7269 7465 5f63 6c75 7374 6572 5f66 756e 6374 696f 6e28 432c 2053 7472 6561 6d29 2c0a 0977 7269
```

| | | | | | | | | | | | | | | | | | | | | | | | | |
|---|---|---|---|---|---|---|---|---|---|---|---|---|---|---|---|---|---|---|---|---|---|---|---|---|
| 3034020 | 7465 | 5f65 | 7374 | 696d | 6174 | 6564 | 5f72 | 6567 | 6973 | 7465 | 7273 | 2852 | 6567 | 2c20 | 5374 | 7265 | 616d | 292c | 0a09 | 7772 | 6974 | 655f | 6573 | 7469 |
| 3034100 | 6d61 | 7465 | 645f | 6d75 | 7865 | 7328 | 4d75 | 782c | 2053 | 7472 | 6561 | 6d29 | 2c0a | 0925 | 2520 | 456e | 6420 | 6f66 | 2066 | 756e | 6374 | 696f | 6e0a | 0977 |
| 3034160 | 7269 | 7465 | 5f65 | 6e64 | 5f66 | 756e | 2853 | 7472 | 6561 | 6d29 | 2c0a | 0925 | 2520 | 496e | 7374 | 616e | 7469 | 6174 | 6520 | 6675 | 6e63 | 7469 | 6f6e | 0a09 |
| 3034240 | 7772 | 6974 | 655f | 696e | 7374 | 2853 | 7472 | 6561 | 6d2c | 2046 | 756e | 6374 | 696f | 6e2c | 205f | 496e | 7374 | 616e | 6365 | 292e | 0a0a | 7772 | 6974 | 655f |
| 3034320 | 636c | 7573 | 7465 | 725f | 6675 | 6e63 | 7469 | 6f6e | 2843 | 2c20 | 5374 | 7265 | 616d | 2920 | 3a2d | 0a09 | 636c | 7573 | 7465 | 725f | 6675 | 6e63 | 7469 | 6f6e |
| 3034400 | 2843 | 2c20 | 4765 | 6e65 | 7269 | 634e | 616d | 652c | 2049 | 6e64 | 7573 | 7472 | 794e | 616d | 6529 | 2c0a | 0963 | 6765 | 6e73 | 796d | 2847 | 656e | 6572 | 6963 |
| 3034460 | 4e61 | 6d65 | 2c20 | 4d65 | 6761 | 4675 | 6e63 | 7469 | 6f6e | 292c | 0a09 | 7772 | 6974 | 655f | 6d65 | 6761 | 6675 | 6e28 | 5374 | 7265 | 616d | 2c20 | 4d65 | 6761 |
| 3034540 | 4675 | 6e63 | 7469 | 6f6e | 2c20 | 496e | 6475 | 7374 | 7279 | 4e61 | 6d65 | 2c20 | 3129 | 2e0a | 0a77 | 7269 | 7465 | 5f65 | 7374 | 696d | 6174 | 6564 | 5f72 | 6567 |
| 3034620 | 6973 | 7465 | 7273 | 2852 | 2c20 | 5374 | 7265 | 616d | 2920 | 3a2d | 0a09 | 280a | 0920 | 2020 | 2052 | 203d | 5c3d | 2030 | 202d | 3e0a | 0920 | 2020 | 2028 | 0a09 |
| 3034700 | 0972 | 756e | 6974 | 2931 | 362c | 2047 | 656e | 6572 | 6963 | 4e61 | 6d65 | 2c20 | 496e | 6475 | 7374 | 7279 | 4e61 | 6d65 | 292c | 2021 | 0a09 | 2020 | 2020 | 3b0a |
| 3034760 | 0920 | 2020 | 2020 | 2020 | 2066 | 6f72 | 6d61 | 7428 | 272a | 2a2a | 2045 | 7272 | 6f72 | 3a20 | 4361 | 6e6e | 6f74 | 2066 | 696e | 6420 | 7e64 | 2062 | 6974 | 2072 |
| 3035040 | 6567 | 2069 | 6e20 | 7468 | 6520 | 6c69 | 6272 | 6172 | 792e | 272c | 0a09 | 0920 | 2020 | 2020 | 2020 | 5b31 | 365d | 292c | 0a20 | 2020 | 2020 | 2020 | 2020 | 2020 |
| 3035120 | 2020 | 2020 | 2066 | 6169 | 6c0a | 0920 | 2020 | 2029 | 2c0a | 0920 | 2020 | 2063 | 6765 | 6e73 | 796d | 2847 | 656e | 6572 | 6963 | 4e61 | 6d65 | 2c20 | 4d65 | 6761 |
| 3035200 | 4675 | 6e63 | 7469 | 6f6e | 292c | 0a09 | 2020 | 2020 | 7772 | 6974 | 655f | 6d65 | 6761 | 6675 | 6e28 | 5374 | 7265 | 616d | 2c20 | 4d65 | 6761 | 4675 | 6e63 | 7469 |
| 3035260 | 5f6e | 2c20 | 496e | 6475 | 7374 | 7279 | 4e61 | 6d65 | 2c20 | 5229 | 0a09 | 3b0a | 0920 | 2020 | 2074 | 7275 | 650a | 2020 | 2020 | 2020 | 2020 | 292e | 0a0a | 7772 |
| 3035340 | 6974 | 655f | 6573 | 7469 | 6d61 | 7465 | 645f | 6d75 | 7865 | 7328 | 4d2c | 2053 | 7472 | 6561 | 6d29 | 203a | 2d0a | 0977 | 7269 | 7465 | 5f6d | 7578 | 6573 | 2853 |
| 3035420 | 7472 | 6561 | 6d2c | 204d | 292e | 0a0a | 7772 | 6974 | 655f | 6d75 | 7865 | 7328 | 5f2c | 205b | 5d29 | 203a | 2d20 | 212e | 0a77 | 7269 | 7465 | 5f6d | 7578 | 6573 |
| 3035500 | 2853 | 7472 | 6561 | 6d2c | 205b | 6d75 | 7828 | 4269 | 7473 | 2c20 | 506f | 7274 | 7329 | 7c52 | 6573 | 745d | 2920 | 3a2d | 0a09 | 280a | 0920 | 2020 | 206d | 7578 |
| 3035560 | 756e | 6974 | 2842 | 6974 | 732c | 2050 | 6f72 | 7473 | 2c20 | 4765 | 6e65 | 7269 | 634e | 616d | 652c | 2049 | 6e64 | 7573 | 7472 | 794e | 616d | 6529 | 2c20 | 210a |
| 3035640 | 093b | 0a09 | 2020 | 2020 | 666f | 726d | 6174 | 2827 | 2a2a | 2a20 | 4572 | 726f | 723a | 2043 | 616e | 6e6f | 7420 | 6669 | 6e64 | 207e | 6420 | 6269 | 7420 | 7e64 |
| 3035720 | 2070 | 6f72 | 7420 | 6175 | 7820 | 696e | 2074 | 6865 | 206c | 6962 | 7261 | 7279 | 7e6e | 2e27 | 2c0a | 0920 | 2020 | 2020 | 2020 | 2020 | 5b42 | 6974 | 732c |
| 3036000 | 2050 | 6f72 | 7473 | 5d29 | 2c0a | 2020 | 2020 | 2020 | 2020 | 2020 | 2020 | 6661 | 696c | 0a09 | 292c | 0a09 | 6367 | 656e | 7379 | 6d28 | 4765 | 6e65 | 7269 | 634e |
| 3036060 | 616d | 652c | 204d | 6567 | 6146 | 756e | 6374 | 696f | 6e29 | 2c0a | 0977 | 7269 | 7465 | 5f6d | 6567 | 6166 | 756e | 2853 | 7472 | 6561 | 6d2c | 204d | 6567 | 6146 |
| 3036140 | 756e | 6374 | 696f | 6e2c | 2049 | 6e64 | 7573 | 7472 | 794e | 616d | 652c | 2031 | 292c | 0a09 | 212c | 0a09 | 7772 | 6974 | 655f | 6d75 | 7865 | 7328 | 5374 | 7265 |
| 3036220 | 616d | 2c20 | 5265 | 7374 | 292e | 0a0a | 636c | 7573 | 7465 | 725f | 6675 | 6e63 | 7469 | 6f6e | 2843 | 2c20 | 4765 | 6e65 | 7269 | 634e | 616d | 652c | 2049 | 6e64 |
| 3036300 | 7573 | 7472 | 794e | 616d | 6529 | 203a | 2d0a | 096f | 7065 | 7261 | 746f | 725f | 6e75 | 6d62 | 6572 | 735f | 616e | 645f | 6964 | 7328 | 432c | 204f | 7065 | 7261 |
| 3036360 | 746f | 7249 | 4473 | 292c | 0a09 | 6f70 | 6572 | 6174 | 6f72 | 5f6f | 7063 | 6f64 | 655f | 7479 | 7065 | 7328 | 4f70 | 6572 | 6174 | 6f72 | 4944 | 732c | 204f | 7065 |
| 3036440 | 7261 | 7469 | 6f6e | 7329 | 2c0a | 0928 | 0a09 | 2020 | 2020 | 6675 | 6e69 | 7428 | 4f70 | 6572 | 6174 | 696f | 6e73 | 2c20 | 4765 | 6e65 | 7269 | 634e | 616d | 652c |
| 3036520 | 2049 | 6e64 | 7573 | 7472 | 794e | 616d | 6529 | 2c21 | 0a09 | 3b0a | 0920 | 2020 | 206e | 6c2c | 0a09 | 2020 | 2020 | 7772 | 6974 | 6528 | 272a | 2a2a | 2020 | 4361 |
| 3036600 | 6e6e | 6f74 | 2066 | 696e | 6420 | 6675 | 6e63 | 7469 | 6f6e | 616c | 2075 | 6e69 | 7420 | 666f | 7220 | 2729 | 2c0a | 0920 | 2020 | 2077 | 7269 | 7465 | 284f | 7065 |
| 3036660 | 7261 | 7469 | 6f6e | 7329 | 2c0a | 0920 | 2020 | 2077 | 7269 | 7465 | 2827 | 2069 | 6e20 | 7468 | 6520 | 6c69 | 6272 | 6172 | 792e | 2729 | 2c6e | 6c2c | 0a09 | 2020 |
| 3036740 | 2020 | 6661 | 696c | 0a09 | 292e | 0a0a | 636c | 7573 | 7465 | 725f | 6f70 | 6572 | 6174 | 696f | 6e73 | 2843 | 6c75 | 7374 | 6572 | 2c20 | 4f70 | 6572 | 6174 | 696f |
| 3037020 | 6e73 | 2920 | 3a2d | 0a09 | 6f70 | 6572 | 6174 | 6f72 | 5f6e | 756d | 6265 | 7273 | 5f61 | 6e64 | 5f69 | 6473 | 2843 | 6c75 | 7374 | 6572 | 2c20 | 4f70 | 6572 | 6174 |
| 3037100 | 6f72 | 4944 | 7329 | 2c0a | 096f | 7065 | 7261 | 746f | 725f | 6f70 | 636f | 6465 | 5f74 | 7970 | 6573 | 284f | 7065 | 7261 | 746f | 7249 | 4473 | 2c20 | 4f70 | 6572 |
| 3037160 | 6174 | 696f | 6e73 | 292e | 0a09 | 0a25 | 2520 | 5265 | 7475 | 726e | 7320 | 6120 | 7365 | 7420 | 6f66 | 206f | 7065 | 7261 | 7469 | 6f6e | 2074 | 7970 | 6573 | 2066 |
| 3037240 | 6f75 | 6e64 | 2069 | 6e20 | 7468 | 6520 | 6c69 | 7374 | 206f | 6620 | 6f70 | 6572 | 6174 | 6f72 | 7320 | 6769 | 7665 | 6e0a | 2525 | 2062 | 7920 | 4f70 | 6572 | 6174 |
| 3037320 | 6f72 | 4944 | 732e | 0a20 | 2020 | 200a | 6f70 | 6572 | 6174 | 6f72 | 5f6f | 7063 | 6f64 | 655f | 7479 | 7065 | 7328 | 4f70 | 6572 | 6174 | 6f72 | 4944 | 732c | 204f |
| 3037400 | 7054 | 7970 | 6573 | 2920 | 3a2d | 0a09 | 6f70 | 6572 | 6174 | 6f72 | 735f | 616e | 645f | 6f70 | 636f | 6465 | 7328 | 4f70 | 6572 | 6174 | 6f72 | 4944 | 732c | 204f |
| 3037460 | 7043 | 6f64 | 6573 | 292c | 0a09 | 6c69 | 7374 | 5f74 | 6f5f | 6f72 | 645f | 7365 | 7428 | 4f70 | 436f | 6465 | 732c | 204f | 7054 | 7970 | 6573 | 292e | 0a09 | 0a25 |
| 3037540 | 2520 | 5265 | 7475 | 726e | 7320 | 6120 | 6c69 | 7374 | 206f | 6620 | 6f70 | 636f | 6465 | 7320 | 636f | 7272 | 6573 | 706f | 6e64 | 696e | 6720 | 746f | 2074 | 6865 |
| 3037620 | 206c | 6973 | 7420 | 6f66 | 206f | 7065 | 7261 | 746f | 7273 | 2067 | 6976 | 656e | 0a25 | 2520 | 6279 | 204f | 7065 | 7261 | 746f | 7249 | 4473 | 2e0a | 0a6f | 7065 |
| 3037700 | 7261 | 746f | 7273 | 5f61 | 6e64 | 5f6f | 7063 | 6f64 | 6573 | 285b | 5d2c | 205b | 5d29 | 2e0a | 6f70 | 6572 | 6174 | 6f72 | 735f | 616e | 645f | 6f70 | 636f | 6465 |
| 3037760 | 7328 | 5b4f | 7049 | 647c | 5461 | 696c | 5d2c | 205b | 4f70 | 436f | 6465 | 7c52 | 6573 | 745d | 2920 | 3a2d | 0a09 | 6f70 | 6572 | 6174 | 6f72 | 5f61 | 6e64 | 5f69 |
| 3040040 | 6428 | 4f70 | 2c20 | 4f70 | 4964 | 292c | 0a09 | 6f70 | 6572 | 6174 | 6f72 | 5f6f | 7063 | 6f64 | 6528 | 4f70 | 2c20 | 4f70 | 436f | 6465 | 292c | 212c | 0a09 | 6f70 |
| 3040120 | 6572 | 6174 | 6f72 | 735f | 616e | 645f | 6f70 | 636f | 6465 | 7328 | 5461 | 696c | 2c20 | 5265 | 7374 | 292e | 0a0a | 6465 | 7369 | 676e | 5f70 | 726f | 6c6f | 6775 |
| 3040200 | 6528 | 4465 | 7369 | 676e | 292c | 3a2d | 0a09 | 636c | 6561 | 725f | 6675 | 6e63 | 7469 | 6f6e | 5f73 | 796d | 626f | 6c5f | 636f | 756e | 7465 | 7273 | 2c0a | 0972 |
| 3040260 | 6574 | 7261 | 6374 | 616c | 6c28 | 6375 | 7272 | 656e | 7428 | 7265 | 616c | 5f69 | 6e70 | 7574 | 732c | 5f29 | 292c | 0a09 | 7265 | 7472 | 6163 | 7461 | 6c6c | 2863 |
| 3040340 | 7572 | 7265 | 6e74 | 2976 | 7265 | 6769 | 7374 | 6572 | 732c | 5f29 | 292c | 0a09 | 666c | 6174 | 7465 | 6e28 | 4465 | 7369 | 676e | 2c20 | 4f70 | 4e75 | 6d73 | 292c |
| 3040420 | 0a09 | 6f70 | 6572 | 6174 | 6f72 | 5f6e | 756d | 6265 | 7273 | 5f61 | 6e64 | 5f69 | 6473 | 284f | 704e | 756d | 732c | 204f | 7049 | 4473 | 292c | 0a09 | 6f70 | 6572 |
| 3040500 | 6174 | 6f72 | 5f62 | 6c6f | 636b | 5f72 | 6561 | 6c5f | 696e | 7075 | 7473 | 284f | 7049 | 4473 | 2c20 | 5265 | 616c | 496e | 7075 | 7473 | 292c | 0a09 | 7075 | 7464 |
| 3040560 | 625f | 6375 | 7272 | 656e | 7428 | 7265 | 616c | 5f69 | 6e70 | 7574 | 732c | 2052 | 6561 | 6c49 | 6e70 | 7574 | 7329 | 2c0a | 0970 | 7574 | 6462 | 5f63 | 7572 | 7265 |
| 3040640 | 6e74 | 2876 | 7265 | 6769 | 7374 | 6572 | 732c | 205b | 5d29 | 2c0a | 0969 | 6e63 | 725f | 636f | 756e | 7428 | 6465 | 7369 | 676e | 292c | 0a09 | 636f | 756e | 7428 |
| 3040720 | 6465 | 7369 | 676e | 2c20 | 4d29 | 2c0a | 0963 | 6f6e | 6361 | 7428 | 2744 | 4553 | 4947 | 4e27 | 2c20 | 4d2c | 2044 | 6573 | 6967 | 6e4e | 616d | 6529 | 2c0a | 0977 |
| 3041000 | 7269 | 7465 | 5f64 | 646c | 5f70 | 726f | 6c6f | 6775 | 6528 | 4465 | 7369 | 676e | 4e61 | 6d65 | 292e | 0a0a | 6465 | 7369 | 676e | 5f65 | 7069 | 6c6f | 6720 | 3a2d |
| 3041060 | 0a09 | 7772 | 6974 | 655f | 6464 | 6c5f | 6570 | 696c | 6f67 | 2c0a | 0972 | 6574 | 7261 | 6374 | 616c | 6c28 | 6375 | 7272 | 656e | 7428 | 7265 | 616c | 5f69 | 6e70 |

```
3041140 7574 732c 5f29 292c 0a09 7265 7472 6163 7461 6c6c 2863 7572 7265 6e74 2876 7265 6769 7374 6572 732c 5f29 292e 0a0a 2f2a
3041220 200a 0966 6f72 6161 7428 5374 7265 616d 2c20 2728 7365 7474 696e 6720 5e6e 616d 6520 7e61 205e 6173 2066 756e 6320 5e74
3041300 6563 686e 6f6c 6f67 7920 4c43 4131 304b 205e 7061 636b 7368 656c 6c20 6365 7261 6d69 6320 5e64 6965 7369 7a65 2073 7461
3041360 6e64 6172 6429 7e6e 272c 205b 5365 7474 696e 675d 292e 0a2a 2f09 0a0a 636c 6561 725f 6465 7369 676e 7320 3a2d 0a09 7265
3041440 7472 6163 7461 6c6c 2863 7572 7265 6e74 2863 6869 7073 697a 6572 5f72 6570 6f72 742c 205f 2929 2c0a 0969 6e69 745f 636f
3041520 756e 7428 6465 7369 676e 292c 0a09 636c 6561 725f 6675 6e63 7469 6f6e 5f73 796d 626f 6c5f 636f 756e 7465 7273 2e0a 0a63
3041600 6c65 6172 5f66 756e 6374 696f 6e5f 7379 6d62 6f6c 5f63 6f75 6e74 6572 7320 3a2d 0a09 7265 7472 6163 7461 6c6c 2873 7472
3041660 696e 6773 3a67 656e 7379 6d5f 636f 756e 7465 7228 5f2c 5f29 292e 0a0a 2525 2525 2525 2525 2525 2525 2525 2525 2525 2525
3041740 2525 2525 2525 2525 2525 2525 2525 2525 2525 2525 2525 2525 2525 2525 2525 2525 2525 2525 2525 2525 2525 2525 2525 2525
3042020 2525 2525 2525 2525 2525 0a25 2525 2046 6f72 2044 444c 2066 696c 650a 0a63 7265 6174 655f 6464 6c5f 6669 6c65 2846 696c
3042100 6529 203a 2d0a 0963 6f6e 6361 745f 6174 6f6d 285b 4669 6c65 2c20 222e 4444 4c22 5d2c 2044 444c 4669 6c65 292c 0a09 6f70
3042160 656e 2844 444c 4669 6c65 2c20 7772 6974 652c 2053 7472 6561 6d29 2c0a 0970 7574 6462 5f63 7572 7265 6e74 2863 6869 7073
3042240 697a 6572 5f64 646c 5f66 696c 655f 7374 7265 616d 2c20 5374 7265 616d 292e 0a0a 636c 6f73 655f 6464 6c5f 6669 6c65 203a
3042320 2d0a 0972 656d 6f76 6564 625f 6375 7272 656e 7428 6368 6970 7369 7a65 725f 6464 6c5f 6669 6c65 5f73 7472 6561 6d2c 2053
3042400 7472 6561 6d29 2c0a 0963 6c6f 7365 2853 7472 6561 6d29 2e0a 0a72 656d 6f76 655f 6464 6c5f 6669 6c65 2846 696c 6529 203a
3042460 2d0a 0973 7973 7465 6d28 5b27 2f62 696e 2f72 6d20 272c 2046 696c 652c 2027 2e44 444c 275d 292e 0a0a 7772 6974 655f 6464
3042540 6c5f 7072 6f6c 6f67 7565 2844 6573 6967 6e4e 616d 6529 203a 2d0a 0967 6574 6462 5f63 7572 7265 6e74 2863 6869 7073 697a
3042620 6572 5f64 646c 5f66 696c 655f 7374 7265 616d 2c20 5374 7265 616d 292c 212c 0a09 7772 6974 655f 6464 6c5f 7072 6f6c 6f67
3042700 7565 2853 7472 6561 6d2c 2044 6573 6967 6e4e 616d 6529 2e0a 0a77 7269 7465 5f64 646c 5f70 726f 6c6f 6775 6528 5374 7265
3042760 616d 2c20 4465 7369 676e 4e61 6d65 2920 3a2d 0a09 2876 6172 2844 6573 6967 6e4e 616d 6529 202d 3e20 6367 656e 7379 6d28
3043040 2744 4553 4947 4e27 2c20 4465 7369 676e 4e61 6d65 2920 3b20 7472 7565 292c 0a09 7469 6d65 5f73 7461 6d70 2827 2533 5720
3043120 2564 2025 334d 2025 7927 2c20 546f 6461 7929 2c0a 0966 6f72 6d61 7428 5374 7265 616d 2c20 2728 6465 7369 676e 205e 6e61
3043200 6d65 207e 7720 5e64 6174 6520 227e 7722 7e6e 7e6e 272c 205b 4465 7369 676e 4e61 6d65 2c20 546f 6461 795d 292e 0a0a 7772
3043260 6974 655f 6265 6769 6e5f 6675 6e28 4675 6e4e 616d 6529 203a 2d0a 0967 6574 6462 5f63 7572 7265 6e74 2863 6869 7073 697a
3043340 6572 5f64 646c 5f66 696c 655f 7374 7265 616d 2c20 5374 7265 616d 292c 0a09 7772 6974 655f 6265 6769 6e5f 6675 6e28 5374
3043420 7265 616d 2c20 4675 6e4e 616d 6529 2e0a 0a77 7269 7465 5f62 6567 696e 5f66 756e 2853 7472 6561 6d2c 2046 756e 4e61 6d65
3043500 2920 3a2d 0a09 2876 6172 2846 756e 4e61 6d65 2920 2d3e 2063 6765 6e73 796d 2827 4655 4e27 2c20 4675 6e4e 616d 6529 203b
3043560 2074 7275 6529 2c0a 0966 6f72 6d61 7428 5374 7265 616d 2c20 2728 6675 6e20 5e6e 616d 6520 7e61 7e6e 272c 205b 4675 6e4e
3043640 616d 655d 292e 0a0a 7772 6974 655f 656e 645f 6675 6e20 3a2d 0a09 6765 7464 625f 6375 7272 656e 7428 6369 6970 7369 7a65
3043720 725f 6464 6c5f 6669 6c65 5f73 7472 6561 6d2c 2053 7472 6561 6d29 2c0a 0977 7269 7465 5f65 6e64 5f66 756e 2853 7472 6561
3044000 6d29 2e0a 0a77 7269 7465 5f65 6e64 5f66 756e 2853 7472 6561 6d29 203a 2d0a 0977 7269 7465 2853 7472 6561 6d2c 2027 2029
3044060 2729 2c6e 6c28 5374 7265 616d 292e 0a0a 7772 6974 655f 6d65 6761 6675 6e28 4d65 6761 6675 6e4e 616d 652c 2049 6e64 7573
3044140 7472 794e 616d 652c 2054 696d 6573 2920 3a2d 0a09 6765 7464 625f 6375 7272 656e 7428 6368 6970 7369 7a65 725f 6464 6c5f
3044220 6669 6c65 5f73 7472 6561 6d2c 2053 7472 6561 6d29 2c0a 0977 7269 7465 5f6d 6567 6166 756e 2853 7472 6561 6d2c 204d 6567
3044300 6166 756e 4e61 6465 2c20 496e 6475 7374 7279 4e61 6d65 2c20 5469 6d65 7329 2e0a 0a77 7269 7465 5f6d 6567 6166 756e 2853
3044360 7472 6561 6d2c 204d 6567 6166 756e 4e61 6465 2c20 496e 6475 7374 7279 4e61 6d65 2c20 5469 6d65 7329 203a 2d0a 0928 7661
3044440 7228 4d65 6761 6675 6e4e 616d 6529 202d 3e20 6367 656e 7379 6d28 274d 4655 4e27 2c20 4d65 6761 6675 6e4e 616d 6529 203b
3044520 2074 7275 6529 2c0a 0966 6f72 6d61 7428 5374 7265 616d 2c20 2720 2020 2028 6d65 6761 6675 6e20 5e6e 616d 6520 7e77 205e
3044600 696e 646e 616d 6520 7e77 205e 7469 6d65 7320 7e64 297e 6e27 2c0a 0920 2020 2020 2020 2020 2020 2020 2020 5b4d 6567 6166
3044660 756e 4e61 6d65 2c20 496e 6475 7374 7279 4e61 6d65 2c20 5469 6d65 735d 292e 0a0a 7772 6974 655f 696e 7374 2846 756e 6374
3044740 696f 6e2c 2049 6e73 7461 6e63 6529 203a 2d0a 0967 6574 6462 5f63 7572 7265 6e74 2863 6869 7073 697a 6572 5f64 646c 5f66
3045020 696c 655f 7374 7265 616d 2c20 5374 7265 616d 292c 0a09 7772 6974 655f 696e 7374 2853 7472 6561 6d2c 2046 756e 6374 696f
3045100 6e2c 2049 6e73 7461 6e63 6529 2e0a 0a77 7269 7465 5f69 6e73 7428 5374 7265 616d 2c20 4675 6e63 7469 6f6e 2c20 496e 7374
3045160 616e 6365 2920 3a2d 0a09 2876 6172 2849 6e73 7461 6e63 6529 202d 3e20 6367 656e 7379 6d28 2749 4e53 5427 2c20 496e 7374
3045240 616e 6365 2920 3b20 7472 7565 292c 0a09 666f 726d 6174 2853 7472 6561 6d2c 2728 696e 7374 205e 6e61 6d65 207e 7720 5e66
3045320 756e 6320 7e77 205e 7469 6d65 7320 3129 7e6e 7e6e 272c 0a09 2020 2020 2020 2020 2020 2020 2020 205b 496e 7374 616e 6365
3045400 2c20 4675 6e63 7469 6f6e 5d29 2e0a 0a77 7269 7465 5f65 7661 6c5f 7365 7474 696e 6720 3a2d 0a09 6765 7464 625f 6375 7272
3045460 656e 7428 6368 6970 7369 7a65 725f 6464 6c5f 6669 6c65 5f73 7472 6561 6d2c 2053 7472 6561 6d29 2c0a 0954 6563 686e 6f6c
3045540 6f67 7920 3d20 274c 4341 3130 4b27 2c0a 0977 7269 7465 5f65 7661 6c5f 7365 7474 696e 6728 0028 2f68 6f6d 652f 6f73 6173
3045620 322f 622f 7175 696e 7475 732f 7077 312e 312f 6c69 6272 6172 792f 6461 7465 005f 0014 3540 0000 002c b288 b66c 0000 0eba
3045700 7fff ffff 0014 341c 0200 0db5 0100 15ad 0100 33fd 0000 000b 0000 315f 002b 2f68 6f6d 652f 6f73 6173 322f 622f 7175 696e
3045760 7475 732f 7077 312e 312f 6c69 6272 6172 792f 6461 7465 2e70 6c00 6174 0033 2f68 6f6d 652f 6f73 6173 322f 622f 7175 696e
3046040 7475 732f 6765 6e65 7269 632f 7170 6c69 6232 2e35 2f6c 6962 7261 7279 2f64 6174 6500 285b 0036 2f68 6f6d 652f 6f73 6173
3046120 322f 622f 7175 696e 7475 732f 6765 6e65 7269 632f 7170 6c69 6232 2e35 2f6c 6962 7261 7279 2f64 6174 652e 706c 0061 746f
3046200 0000 002c 0014 1414 b27c b66c 0000 0ebd 7fff ffff 0013 ea00 0200 0db5 0200 2f35 0000 70cf 0000 03b3 0000 315f 0014 3a44
```

```
3046260  0000 0098 b288 b66c 0000 0ebc 7fff ffff 0014 3518 0200 0db5 0100 15ad 0100 33fd 0000 000b 0000 315f 0014 35ac 0000 0040
3046340  b27c b66c 0000 0ebc 0000 0ef8 0013 e8b8 0200 0db5 0500 26f5 0000 1fc7 0000 26ef 0000 03b3 0200 09cd 0000 06db 0000 002b
3046420  0000 3a2f 0000 315f 0014 3a44 000c 002c b27c b66c 0000 0ebf 0000 0ef9 000a d16d 0200 0db5 0200 270d 0000 70cf 0000 70af
3046500  0000 315f 0000 002c 0013 eac4 b27c b66c 0000 0ec1 7fff ffff 0015 6520 0200 0db5 0200 284d 0000 70af 0000 70cf 0000 315f
3046560  0000 0000 0010 1a7d 000c 4ae4 000c 0764 000a 2538 0000 0000 0012 c290 0014 5424 000d ca90 0000 0000 0000 0000 0000 0000
3046640  0000 0000 0000 0000 0000 0000 0000 0000 000d cff0 000b 8828 000b abc4 000f 8298 000b b0dd 0014 8a08 0000 0000 0000 0000
3046720  000b 1e3c 000a 2508 0000 0000 0000 0000 0016 8d61 0000 0000 0000 0000 0000 0000 0017 cc08 00cf c5b0 0000 0000 0000 0000
3047000  0000 0000 0000 0000 0000 0000 000c eae4 000d 77ac 0000 0000 0000 0000 000a 2518 0000 0000 0000 0000 0018 3c55 000a 2558
3047060  000d ca58 0014 84f4 0000 0000 0000 0000 0000 0000 0000 0000 000e 8308 0019 304d 000b 1825 000b 4218 0000 0000 0000 0000
3047140  0000 0000 0000 0000 0000 0000 000a 2548 0000 0034 000a fe04 b27c b66c 0000 0ec4 7fff ffff 0014 373c 0200 0db5 0400 242d
3047220  0000 70af 0000 001b 0000 70af 0000 21cf 0000 315f 0000 0034 0014 3708 b27c b66c 0000 0ec5 7fff ffff 0014 3770 0200 0db5
3047300  0400 242d 0000 70d7 0000 000b 0000 70af 0000 21cf 0000 315f 0000 0034 0014 373c b27c b66c 0000 0ec6 7fff ffff 0014 37a4
3047360  0200 0db5 0400 242d 0000 70df 0000 000b 0000 70af 0000 21cf 0000 315f 0000 0034 0014 3770 b27c b66c 0000 0ec7 7fff ffff
3047440  0014 37d8 0200 0db5 0400 242d 0000 70df 0000 0013 0000 70af 0000 21cf 0000 315f 0000 0034 0014 37a4 b27c b66c 0000 0ec8
3047520  7fff ffff 0014 390c 0200 0db5 0400 242d 0000 70df 0000 001b 0000 70af 0000 21cf 0000 315f 0000 0034 0014 37d8 b27c b66c
3047600  0000 0ec9 7fff ffff 0014 3840 0200 0db5 0400 242d 0000 70e7 0000 000b 0000 70af 0000 21cf 0000 315f 0000 0034 0014 380c
3047660  b27c b66c 0000 0eca 7fff ffff 0014 3874 0200 0db5 0400 242d 0000 70e7 0000 0013 0000 70af 0000 21cf 0000 315f 0000 0034
3047740  0014 3840 b27c b66c 0000 0ecb 7fff ffff 0014 38a8 0200 0db5 0400 242d 0000 70e7 0000 001b 0000 70af 0000 21cf 0000 315f
3050020  0000 0034 0014 3874 b27c b66c 0000 0ecc 7fff ffff 0014 38dc 0200 0db5 0400 242d 0000 70e7 0000 0033 0000 70af 0000 21cf
3050100  0000 315f 0000 0034 0014 38a8 b27c b66c 0000 0ecd 7fff ffff 0014 3910 0200 0db5 0400 242d 0000 70e7 0000 003b 0000 70af
3050160  0000 21cf 0000 315f 0000 0034 0014 38dc b27c b66c 0000 0ece 7fff ffff 0014 3944 0200 0db5 0400 242d 0000 70ef 0000 0013
3050240  0000 70af 0000 21cf 0000 315f 0000 0034 0014 3910 b27c b66c 0000 0ecf 7fff ffff 0014 3978 0200 0db5 0400 242d 0000 70ef
3050320  0000 001b 0000 70af 0000 21cf 0000 315f 0000 0034 0014 3944 b27c b66c 0000 0ed0 7fff ffff 0014 39ac 0200 0db5 0400 242d
3050400  0000 70f7 0000 0013 0000 70af 0000 21cf 0000 315f 0000 0034 0014 3978 b27c b66c 0000 0ed1 7fff ffff 0014 39e0 0200 0db5
3050460  0400 242d 0000 70f7 0000 001b 0000 70af 0000 21cf 0000 315f 0000 0034 0014 39ac b27c b66c 0000 0ed2 7fff ffff 0015 654c
3050540  0200 0db5 0400 242d 0000 70ff 0000 000b 0000 70af 0000 21cf 0000 315f 0000 0034 0012 aa00 b27c b66c 0000 0ed3 7fff ffff
3050620  0015 fe30 0200 0db5 0400 24ad 0000 400f 0000 0013 0000 70af 0000 400f 0000 315f 0014 3b28 0000 009c b27c b66c 0000 0ed4
3050700  0000 0efc 0014 3aac 0200 0db5 0500 1cdd 0000 2def 0000 000b 0000 70af 00ac 16e3 0000 03b3 0000 315f 0014 3aa8 0000 002c
3050760  b4f0 b4e4 0000 0ed3 7fff ffff 0008 b0dd 0000 0000 0000 0000 0014 531c 0002 438a 0015 86e0 0014 3b28 0000 0038 b27c b66c
3051040  0000 0ed6 0000 0efd 0014 3b2c 0200 0db5 0500 1cdd 0000 70af 0000 001b 0000 70af 00ab 06a3 0000 03b3 0000 315f 2c78 0048
3051120  0002 438a 3690 2520 46d8 3724 001c 3260 0028 3260 0024 3260 0020 34e0 0018 41fc 0000 0003 4254 0000 0000 0003 4300 0000
3051200  0000 001b 0015 8348 0014 aa34 aaf0 0001 af34 723c 0014 3ba4 0000 0038 b27c b66c 0000 0ed7 0000 0efe 0014 3ba8 0200 0db5
3051260  0500 1cdd 0000 70af 0000 000b 0000 70af 00ab 04a3 0000 03b3 0000 315f 2c78 0044 0002 438a 5d10 0000 0300 70af 67b8 66c0
3051340  0018 001c 3260 0028 3260 0024 3260 0020 4268 0000 0000 0003 4254 0000 0000 0003 4240 0000 0000 001b 239c 0000 0015 8348
3051420  0014 3c64 0000 0038 b27c b66c 0000 0ed8 0000 0eff 0014 3c68 0200 0db5 0500 1cdd 0000 70af 0000 0013 0000 70af 00ab 05a3
3051500  0000 03b3 0000 315f 2c78 0088 0002 438a 5d10 0000 0200 710f 6868 6af0 001c 5b58 0300 70af 69b0 6a00 6a50 933c 9460 0036
3051560  9350 001c 9460 002e 3260 0028 3260 0024 3260 0020 394c 001c 3930 0018 38ac 3894 001c 3818 4240 0000 0000 000b 242c 0000
3051640  0015 8348 3984 0024 001c 3968 0020 4290 0000 001c 0000 0003 4224 0018 0000 0003 427c 0000 0000 0003 23fc 0000 0015 838c
3051720  0014 3cd8 0000 0038 b27c b66c 0000 0ed9 0000 0f00 0014 3cdc 0200 0db5 0500 1cdd 0000 70df 0000 001b 0000 70af 00ab 0aa3
3052000  0000 03b3 0000 315f 2c78 003c 0002 43da 36f4 0020 370c 0024 3724 0028 3260 001c 3260 0018 3244 41fc 0000 0003 4254 0000
3052060  0000 0003 4240 0000 0000 001b 239c 0000 0015 8348 0014 3d54 0000 0038 b27c b66c 0000 0eda 0000 0f01 0014 3d58 0200 0db5
3052140  0500 1cdd 0000 70df 0000 000b 0000 70af 00ab 08a3 0000 03b3 0000 315f 2c78 0044 0002 438a 5d10 0000 0300 70df 67ec 0020
3052220  66c0 0024 0028 3260 001c 3260 0018 3244 4268 0000 0000 0003 4254 0000 0000 0003 4240 0000 0000 001b 239c 0000 0015 8348
3052300  0014 3e50 0000 0038 b27c b66c 0000 0edb 0000 0f02 0014 3e54 0200 0db5 0500 1cdd 0000 70df 0000 0013 0000 70af 00ab 09a3
3052360  0000 03b3 0000 315f 2c78 00c4 0002 438a 5d10 0000 0200 710f 687c 0024 6af0 0028 5d7c 0000 0300 70df 6aa0 6af0 001c 6af0
3052440  0020 9350 0024 9460 003c 9350 0028 9460 0034 3984 0028 0020 3984 0024 001c 3968 0020 3260 001c 3260 0018 3244 3894 0028
3052520  382c 0024 4240 0000 0000 000b 242c 0000 0015 8348 3260 0028 3260 0024 3260 0020 3500 001c 34e0 0018 3430 41fc 0000 0003
3052600  4254 0000 0000 0003 4300 0000 0000 001b 0015 8348 002c 3984 0024 0028 3984 0020 0024 3984 001c 0020 3984 0018 001c 38e8
3052660  3d6c 3d30 3cf4 234c 0015 838c 0014 3ec8 0000 0038 b27c b66c 0000 0edc 0000 0f03 0014 3ecc 0200 0db5 0500 1cdd 0000 70e7
3052740  0000 000b 0000 70af 00ab 0ba3 0000 03b3 0000 315f 2c78 0040 0002 438a 5d10 0000 0600 70af 6530 0018 66c0 001c 0020 66c0
3053020  0024 0028 4268 0000 0000 0003 4254 0000 0000 0003 4240 0000 0000 001b 239c 0000 0015 8348 0014 3f90 0000 0038 b27c b66c
3053100  0000 0edd 0000 0f04 0014 3f94 0200 0db5 0500 1cdd 0000 70e7 0000 0013 0000 70af 00ab 0ca3 0000 03b3 0000 315f 2c78 0090
3053160  0002 438a 5d10 0000 0200 710f 687c 0024 6af0 0028 5d7c 0000 0600 70af 69b0 6a00 6a50 6aa0 6af0 001c 6af0 0020 9350 0024
3053240  9460 003a 9350 0028 9460 0032 3984 0028 0020 3984 0024 001c 3968 0020 394c 001c 3930 0018 38ac 3894 0028 382c 0024 41d4
3053320  0000 000b 242c 0000 0015 8348 3984 0024 0028 3984 0020 0024 3984 001c 0020 3984 0018 001c 23e4 0000 0015 838c 0014 400c
```

| | | | | | | | | | | | | | | | | | | | | | | | | |
|---|---|---|---|---|---|---|---|---|---|---|---|---|---|---|---|---|---|---|---|---|---|---|---|---|
| 3053400 | 0000 | 0038 | b27c | b66c | 0000 | 0ede | 0000 | 0f05 | 0014 | 4010 | 0200 | 0db5 | 0500 | 1cdd | 0000 | 70e7 | 0000 | 001b | 0000 | 70af | 00ab | 0da3 | 0000 | 03b3 |
| 3053460 | 0000 | 315f | 2c78 | 0042 | 0002 | 438a | 5d10 | 0000 | 0600 | 70af | 66c0 | 0024 | 0020 | 66c0 | 001c | 0018 | 6420 | 5b58 | 0300 | 70af | 6c84 | 0024 | 6c84 | 0020 |
| 3053540 | 6c84 | 001c | 5de8 | 0000 | 0300 | 70df | 6c84 | 0018 | 6c34 | 6b74 | 228c | 616e | 0014 | 4090 | 0000 | 0038 | b27c | b66c | 0000 | 0edf | 0000 | 0f06 | 0014 | 4094 |
| 3053620 | 0200 | 0db5 | 0500 | 1cdd | 0000 | 70e7 | 0000 | 0033 | 0000 | 70af | 00ab | 0ea3 | 0000 | 03b3 | 0000 | 315f | 2c78 | 004c | 0002 | 438a | 2520 | 46d8 | 373c | 0020 |
| 3053700 | 3754 | 0024 | 0018 | 3754 | 0028 | 001c | 3724 | 001c | 34e0 | 0018 | 3690 | 41fc | 0000 | 0003 | 4254 | 0000 | 0000 | 0003 | 4300 | 0000 | 0000 | 001b | 0015 | 8348 |
| 3053760 | 0014 | aa34 | aaf0 | 0001 | af34 | 723c | 0014 | 416c | 0000 | 0038 | b27c | b66c | 0000 | 0ee0 | 0000 | 0f07 | 0014 | 4170 | 0200 | 0db5 | 0500 | 1cdd | 0000 | 70e7 |
| 3054040 | 0000 | 003b | 0000 | 70af | 00ab | 0fa3 | 0000 | 03b3 | 0000 | 315f | 2c78 | 00a4 | 0002 | 438a | 5d10 | 0000 | 0200 | 710f | 687c | 0024 | 6af0 | 0028 | 46d8 | 4790 |
| 3054120 | 002c | 47d0 | 4864 | 0018 | 4880 | 001c | 001c | 4880 | 0020 | 0020 | 9350 | 0024 | 9460 | 0044 | 9350 | 0028 | 9460 | 003c | 3984 | 0028 | 0020 | 3984 | 0024 | 001c |
| 3054200 | 3968 | 0020 | 394c | 001c | 34e0 | 0018 | 38ac | 3894 | 0028 | 382c | 0024 | 42ac | 0000 | 000b | 0015 | 8348 | 0030 | aa34 | aaf0 | 0001 | af84 | 002c | 723c | aa88 |
| 3054260 | 002c | aaf0 | ffff | ada8 | 3984 | 0024 | 0028 | 3984 | 0020 | 0024 | 3984 | 001c | 0020 | 3984 | 0018 | 001c | 23e4 | 0000 | 0015 | 838c | 0014 | 41ec | 0000 | 0038 |
| 3054340 | b27c | b66c | 0000 | 0ee1 | 0000 | 0f08 | 0014 | 41f0 | 0200 | 0db5 | 0500 | 1cdd | 0000 | 70ef | 0000 | 0013 | 0000 | 70af | 00ab | 10a3 | 0000 | 03b3 | 0000 | 315f |
| 3054420 | 2c78 | 0048 | 0002 | 438a | 5d10 | 0000 | 0300 | 70af | 67b8 | 66c0 | 0018 | 001c | 5d7c | 0000 | 0300 | 70df | 67ec | 0020 | 66c0 | 0024 | 0028 | 41fc | 0000 | 0003 |
| 3054500 | 4254 | 0000 | 0000 | 0003 | 4240 | 0000 | 0000 | 001b | 239c | 0000 | 0015 | 8348 | 0014 | 42bc | 0000 | 0038 | b27c | b66c | 0000 | 0ee2 | 0000 | 0f09 | 0014 | 42c0 |
| 3054560 | 0200 | 0db5 | 0500 | 1cdd | 0000 | 70ef | 0000 | 001b | 0000 | 70af | 00ab | 11a3 | 0000 | 03b3 | 0000 | 315f | 2c78 | 0098 | 0002 | 438a | 5d10 | 0000 | 0200 | 710f |
| 3054640 | 687c | 0024 | 6af0 | 0028 | 5d7c | 0000 | 0300 | 70af | 69b0 | 6a00 | 6a50 | 5bc4 | 0300 | 70df | 6aa0 | 6af0 | 001c | 6af0 | 0020 | 9350 | 0024 | 9460 | 003c | 9350 |
| 3054720 | 0028 | 9460 | 0034 | 3984 | 0028 | 0020 | 3984 | 0024 | 001c | 3968 | 0020 | 394c | 001c | 3930 | 0018 | 38ac | 3894 | 0028 | 382c | 0024 | 4240 | 0000 | 0000 | 000b |
| 3055000 | 242c | 0000 | 0015 | 8348 | 3984 | 0024 | 0028 | 3984 | 0020 | 0024 | 3984 | 001c | 0020 | 3984 | 0018 | 001c | 23e4 | 0000 | 0015 | 838c | 0014 | 4368 | 0000 | 0038 |
| 3055060 | b27c | b66c | 0000 | 0ee3 | 0000 | 0f0a | 0014 | 436c | 0290 | 0db5 | 0500 | 1cdd | 0000 | 70d7 | 0000 | 000b | 0000 | 70af | 00ab | 07a3 | 0000 | 03b3 | 0000 | 315f |
| 3055140 | 2c78 | 0074 | 0002 | 438a | 5d10 | 0000 | 0200 | 710f | 687c | 0024 | 6af0 | 0028 | 3540 | 0028 | 0020 | 3540 | 0024 | 001c | 3520 | 0020 | 3500 | 001c | 34e0 | 0018 |
| 3055220 | 3430 | 41fc | 0000 | 0003 | 4254 | 0000 | 0000 | 0003 | 4300 | 0000 | 0000 | 001b | 0015 | 8348 | 002c | 3984 | 0024 | 0028 | 3984 | 0020 | 0024 | 3fe4 | 001c | 0020 |
| 3055300 | 3fe4 | 0018 | 001c | 31a8 | 3d6c | 3d30 | 3cf4 | 234c | 0015 | 838c | 0014 | 43d0 | 0000 | 0038 | b27c | b66c | 0000 | 0ee4 | 0000 | 0f0b | 0014 | 43d4 | 0200 | 0db5 |
| 3055360 | 0500 | 1cdd | 0000 | 53c7 | 0000 | 0043 | 0000 | 70af | 00ac | 1c63 | 0000 | 03b3 | 0000 | 315f | 2c78 | 0030 | 0002 | 438a | 2520 | 34c0 | 002c | 4290 | 0000 | 0028 |
| 3055440 | 0000 | 000b | 24d0 | 0000 | 0015 | 8540 | 0010 | 41e8 | 0000 | 53c7 | 3cf4 | 234c | 000c | aec4 | 0014 | 4444 | 0000 | 0038 | b27c | b66c | 0000 | 0ee5 | 0000 | 0f0c |
| 3055520 | 0014 | 4448 | 0200 | 0db5 | 0500 | 1cdd | 0000 | 70af | 0000 | 004b | 0000 | 70af | 00ac | 1a43 | 0000 | 03b3 | 0000 | 315f | 2c78 | 003c | 0002 | 438a | 3754 | 002c |
| 3055600 | 0028 | 2520 | 34c0 | 0030 | 3754 | 0028 | 0024 | 3754 | 0024 | 0020 | 3260 | 0020 | 24d0 | 0000 | 0015 | 8560 | 0010 | 41e8 | 0000 | 70af | 3cf4 | 234c | 000c | aec4 |
| 3055660 | 0014 | 4510 | 0000 | 0038 | b27c | b66c | 0000 | 0ee6 | 0000 | 0f0d | 0014 | 4514 | 0200 | 0db5 | 0500 | 1cdd | 0000 | 70f7 | 0000 | 0013 | 0000 | 70af | 00ab | 12a3 |
| 3055740 | 0000 | 03b3 | 0000 | 315f | 2c78 | 0094 | 0002 | 438a | 45b8 | 4728 | 002c | 3540 | 0030 | 0030 | 3540 | 002c | 0028 | 3540 | 0028 | 0024 | 3540 | 0024 | 0020 | 3540 |
| 3056020 | 0020 | 001c | 3520 | 001c | 3500 | 0018 | 344c | 41fc | 0000 | 0003 | 4254 | 0000 | 0000 | 0003 | 4300 | 0000 | 0000 | 001b | 0015 | 8560 | 0034 | 43e4 | 0200 | 70f7 |
| 3056100 | 6d0c | 6e1c | 002c | 411c | 0000 | 0030 | 000c | aec4 | 0030 | 3984 | 0028 | 002c | 3fe4 | 0024 | 0028 | 3fe4 | 0020 | 0024 | 3fe4 | 001c | 0020 | 3fe4 | 0018 | 001c |
| 3056160 | 3da8 | 3d6c | 3d30 | 2340 | 0015 | 8580 | 0014 | 4704 | 0000 | 0038 | b27c | b66c | 0000 | 0ee7 | 0000 | 0f0e | 0014 | 4708 | 0200 | 0db5 | 0500 | 1cdd | 0000 | 70f7 |
| 3056240 | 0000 | 001b | 0000 | 70af | 00ab | 13a3 | 0000 | 03b3 | 0000 | 315f | 27f0 | 0050 | 0014 | 4594 | 5d10 | 0000 | 0300 | 70af | 67ec | 002c | 6670 | 0030 | 3574 | 3724 |
| 3056320 | 0028 | 4290 | 0000 | 0024 | 0000 | 0003 | 4224 | 0020 | 0000 | 0003 | 4224 | 001c | 0000 | 0003 | 4224 | 0018 | ffff | fffb | 3678 | 0030 | 3614 | 002c | 239c | 0000 |
| 3056400 | 0015 | 8580 | 28c4 | 0040 | 0014 | 45d4 | 5d10 | 0000 | 0600 | 70af | 66c0 | 002c | 0030 | 6530 | 001c | 66c0 | 0020 | 0024 | 3574 | 3724 | 0028 | 4290 | 0000 | 0018 |
| 3056460 | ffff | fffb | 3678 | 0030 | 3614 | 002c | 239c | 0000 | 0015 | 8580 | 28c4 | 009c | 0014 | 4670 | 5d10 | 0000 | 0300 | 70df | 687c | 0020 | 6af0 | 0024 | 6af0 | 0028 |
| 3056540 | 46d8 | 4790 | 002c | 3540 | 0030 | 0030 | 3260 | 002c | 3260 | 0028 | 3260 | 0024 | 3540 | 0020 | 001c | 3520 | 001c | 3500 | 0018 | 344c | 4268 | 0000 | 0000 | 0003 |
| 3056620 | 4254 | 0000 | 0000 | 0003 | 4300 | 0000 | 0000 | 001b | 0015 | 8560 | 0034 | 41e8 | 0000 | 70f7 | 40b4 | 0030 | 000c | aec4 | 0030 | 3984 | 0028 | 002c | 3984 | 0024 |
| 3056700 | 0028 | 3984 | 0020 | 0024 | 3984 | 001c | 0020 | 3fe4 | 0018 | 001c | 3da8 | 3d6c | 3d30 | 2340 | 0015 | 8580 | 2954 | 0090 | 0002 | 438a | 5d10 | 0000 | 0200 | 710f |
| 3056760 | 6110 | 0034 | 2520 | 46d8 | 4790 | 002c | 3540 | 0030 | 0030 | 3540 | 002c | 0028 | 3540 | 0028 | 0024 | 3540 | 0024 | 0020 | 3540 | 0020 | 001c | 3520 | 001c | 3500 |
| 3057040 | 0018 | 344c | 3678 | 0034 | 35c8 | 42ac | 0000 | 000b | 0015 | 8560 | 0034 | 41e8 | 0000 | 70f7 | 40b4 | 0030 | 000c | aec4 | 0030 | 3984 | 0028 | 002c | 3fe4 | 0024 |
| 3057120 | 0028 | 3fe4 | 0020 | 0024 | 3fe4 | 001c | 0020 | 3fe4 | 0018 | 001c | 3da8 | 3d6c | 3d30 | 2340 | 0015 | 8580 | 0014 | 47a8 | 0000 | 0078 | b27c | b66c | 0000 | 0ee8 |
| 3057200 | 0000 | 0f0f | 0014 | 47ac | 0200 | 0db5 | 0500 | 1cdd | 0000 | 70ff | 0000 | 000b | 0000 | 70af | 00ab | 14a3 | 0000 | 03b3 | 0000 | 315f | 0014 | 47a8 | 0000 | 0040 |
| 3057260 | 0000 | 0000 | 0000 | 0000 | 0000 | 0000 | 0000 | 0000 | 0000 | 0000 | 0000 | 0000 | 0000 | 0000 | 0000 | 0000 | 0014 | 926c | 0014 | 827c | 0000 | 0000 | 0014 | 7e18 |
| 3057340 | 0015 | a721 | 0015 | a741 | 2c78 | 002c | 0002 | 438a | 45c4 | 3348 | 3ba0 | 0000 | 0015 | 84a8 | 0018 | 33a0 | 3d3c | 39f8 | 0015 | 6274 | 0010 | 3cf4 | 242c | 0000 |
| 3057420 | 0008 | ec1c | 0014 | 4d6c | 0000 | 0408 | b27c | b66c | 0000 | 0ee9 | 0000 | 0f10 | 0014 | 47e4 | 0200 | 0db5 | 0500 | 1cdd | 0000 | 70ff | 0000 | 0013 | 0000 | 70af |
| 3057500 | 00ac | 2543 | 0000 | 03b3 | 0000 | 315f | 0014 | 4854 | 0000 | 0038 | b27c | b66c | 0000 | 0eea | 0000 | 0f11 | 0014 | 4858 | 0200 | 0db5 | 0500 | 1cdd | 0000 | 22df |
| 3057560 | 0000 | 0013 | 0000 | 70af | 00ac | 3203 | 0000 | 03b3 | 0000 | 315f | 0014 | 4854 | 0000 | 003c | 5d10 | 0000 | 0100 | 3037 | 4b8c | 0000 | 0000 | 7147 | 5758 | 4af8 |
| 3057640 | 0000 | 711f | 55f0 | 4af8 | 0000 | 7127 | 55f0 | 4af8 | 0000 | 7117 | 55f0 | 4af8 | 0000 | 714f | 5370 | 228c | 0014 | 488c | 0000 | 0038 | b27c | b66c | 0000 | 0eeb |
| 3057720 | 0000 | 0f12 | 0014 | 4df4 | 0200 | 0db5 | 0500 | 1cdd | 0000 | 22d7 | 0000 | 0013 | 0000 | 70af | 00ac | 3423 | 0000 | 03b3 | 0000 | 315f | 0014 | 4928 | 0000 | 009c |
| 3060000 | 4e1c | 0000 | 0000 | 714f | 5d7c | 0000 | 0700 | 714f | 67ec | 0020 | 66c0 | 001c | 0018 | 64a8 | 6160 | 5ec0 | 0000 | 0020 | 0100 | 0ab7 | 4b8c | 0000 | 0000 | 253f |
| 3060060 | 5c9c | 001c | 0100 | 0ab7 | 4b8c | 0000 | 0000 | 253f | 5c9c | 0018 | 0100 | 0ab7 | 4b8c | 0000 | 0000 | 253f | 5e54 | 0000 | 0100 | 0ab7 | 4b8c | 0000 | 0000 | 253f |
| 3060140 | 5de8 | 0000 | 0100 | 0ab7 | 4b8c | 0000 | 0000 | 253f | 5d7c | 0000 | 0100 | 0ad7 | 4b8c | 0000 | 0000 | 253f | 5d10 | 0000 | 0100 | 0ad7 | 4b8c | 0000 | 0000 | 253f |
| 3060220 | 228c | 2c20 | 0014 | 4a14 | 0000 | 00ec | 4e1c | 0000 | 0000 | 711f | 5d7c | 0000 | 0b00 | 711f | 67ec | 0030 | 66c0 | 002c | 0028 | 66c0 | 0024 | 0020 | 66c0 | 001c |
| 3060300 | c018 | 64a8 | 6160 | 5ec0 | 0000 | 0030 | 0100 | 0ab7 | 4b8c | 0000 | 0000 | 253f | 5c9c | 002c | 0100 | 0ab7 | 4b8c | 0000 | 0000 | 253f | 5c9c | 0028 | 0100 | 0ab7 |
| 3060360 | 4b8c | 0000 | 0000 | 253f | 5c9c | 0024 | 0100 | 0ad7 | 4b8c | 0000 | 0000 | 253f | 5c9c | 0020 | 0100 | 0ad7 | 4b8c | 0000 | 0000 | 253f | 5c9c | 001c | 0100 | 0ad7 |
| 3060440 | 4b8c | 0000 | 0000 | 253f | 5c9c | 0018 | 0100 | 0ad7 | 4b8c | 0000 | 0000 | 253f | 5e54 | 0000 | 0100 | 0ad7 | 4b8c | 0000 | 0000 | 253f | 5de8 | 0000 | 0100 | 0ad7 |

| | | | | | | | | | | | | | | | | | | | | | | | | |
|---|---|---|---|---|---|---|---|---|---|---|---|---|---|---|---|---|---|---|---|---|---|---|---|---|
| 3060520 | 4b8c | 0000 | 0000 | 253f | 5d7c | 0000 | 0100 | 0ad7 | 4b8c | 0000 | 0000 | 253f | 56f8 | 671c | 5370 | 5aec | 0100 | 0ad7 | 4b8c | 0000 | 0000 | 253f | 228c | 7320 |
| 3060600 | 0014 | 4ad8 | 0000 | 00c4 | 4e1c | 0000 | 0000 | 7127 | 5d7c | 0000 | 0900 | 7127 | 67ec | 0028 | 66c0 | 0024 | 0020 | 66c0 | 001c | 0018 | 64a8 | 6160 | 5c9c | 0028 |
| 3060660 | 0100 | 0ab7 | 4b8c | 0000 | 0000 | 2fdf | 5c9c | 0024 | 0100 | 0ab7 | 4b8c | 0000 | 0000 | 253f | 5c9c | 0020 | 0100 | 0ab7 | 4b8c | 0000 | 0000 | 253f | 5c9c | 001c |
| 3060740 | 0100 | 0ab7 | 4b8c | 0000 | 0000 | 253f | 5c9c | 0018 | 0100 | 0ab7 | 4b8c | 0000 | 0000 | 253f | 5e54 | 0000 | 0100 | 0ab7 | 4b8c | 0000 | 0000 | 253f | 5de8 | 0000 |
| 3061020 | 0100 | 0ab7 | 4b8c | 0000 | 0000 | 253f | 5d7c | 0000 | 0100 | 0ab7 | 4b8c | 0000 | 0000 | 253f | 56f8 | 671c | 5370 | 5aec | 0100 | 0ad7 | 4b8c | 0000 | 0000 | 1d8f |
| 3061100 | 228c | 7320 | 0014 | 4d6c | 0000 | 00d8 | 4e1c | 0000 | 0000 | 7117 | 5d7c | 0000 | 0a00 | 7117 | 66c0 | 002c | 0028 | 66c0 | 0024 | 0020 | 66c0 | 001c | 0018 | 64a8 |
| 3061160 | 6160 | 5ec0 | 0000 | 002c | 0100 | 0ab7 | 4b8c | 0000 | 0000 | 253f | 5c9c | 0028 | 0100 | 0ab7 | 4b8c | 0000 | 0000 | 253f | 5c9c | 0024 | 0100 | 0ab7 | 4b8c | 0000 |
| 3061240 | 0000 | 253f | 5c9c | 0020 | 0100 | 0ab7 | 4b8c | 0000 | 0000 | 253f | 5c9c | 001c | 0100 | 0ab7 | 4b8c | 0000 | 0000 | 253f | 5c9c | 0018 | 0100 | 0ab7 | 4b8c | 0000 |
| 3061320 | 0000 | 253f | 5e54 | 0000 | 0100 | 0ad7 | 4b8c | 0000 | 0000 | 253f | 5de8 | 0000 | 0100 | 0ad7 | 4b8c | 0000 | 0000 | 253f | 5d7c | 0000 | 0100 | 0ab7 | 4b8c | 0000 |
| 3061400 | 0000 | 253f | 56f8 | 671c | 5370 | 5aec | 0100 | 0ad7 | 4b8c | 0000 | 0000 | 253f | 228c | 2020 | 003e | 2f68 | 6f6d | 652f | 6f73 | 6173 | 322f | 622f | 7175 | 696e |
| 3061460 | 7475 | 732f | 6765 | 6e65 | 7269 | 632f | 7170 | 6c69 | 6232 | 2e35 | 2f6c | 6962 | 7261 | 7279 | 2f73 | 756e | 342d | 342e | 302f | 6461 | 7465 | 2e6f | 0027 | 6e61 |
| 3061540 | 003c | 2f68 | 6f6d | 652f | 6f73 | 6173 | 322f | 622f | 7175 | 696e | 7475 | 732f | 6765 | 6e65 | 7269 | 632f | 7170 | 6c69 | 6232 | 2e35 | 2f6c | 6962 | 7261 | 7279 |
| 3061620 | 2f73 | 756e | 342d | 342f | 6461 | 7465 | 2e6f | 0028 | 0000 | 002c | 0013 | e8b8 | b27c | b66c | 0000 | 0efa | 7fff | ffff | 0013 | c024 | 0200 | 0db5 | 0200 | 224d |
| 3061700 | 0000 | 70cf | 0000 | 70af | 0000 | 315f | 0003 | 7274 | 6c00 | 0000 | 0000 | 002c | 0013 | c059 | b27c | b66c | 0000 | 0efb | 7fff | ffff | 0015 | 64f4 | 0200 | 0db5 |
| 3061760 | 0200 | 24bd | 0000 | 3287 | 0000 | 70af | 0000 | 315f | 2c78 | 0034 | 0002 | 438a | 7ae4 | 0000 | 8154 | 0024 | 8154 | 0020 | 8154 | 001c | 8154 | 0018 | 8148 | 813c |
| 3062040 | 8130 | 805c | 7ebc | 0000 | 0015 | 8d60 | 0020 | 8888 | 0028 | 228c | 2c78 | 003c | 0002 | 438a | 7ae4 | 0008 | 8154 | 0028 | 7ed4 | 7ed4 | 8154 | 001c | 8154 | 0018 |
| 3062120 | 8148 | 813c | 8130 | 8124 | 7ebc | 0000 | 0015 | 89d8 | 0024 | 8924 | 002c | 891c | 0020 | 891c | 0024 | 228c | 2c78 | 0030 | 0002 | 438a | 7ae4 | 0008 | 7ed4 | 7ed4 |
| 3062200 | 8154 | 0013 | 8148 | 813c | 8130 | 8124 | 7ebc | 0000 | 0015 | 91f4 | 001c | 891c | 001c | 891c | 0020 | 228c | 0000 | 0038 | 0013 | c448 | b27c | b66c | 0000 | 0ef2 |
| 3062260 | 7fff | ffff | 0016 | bfc0 | 0200 | 0db5 | 0300 | 22e5 | 0000 | 0001 | 0000 | 715f | 0000 | 0007 | 0000 | 0007 | 0000 | 70af | 0000 | 315f | 0014 | 5138 | 0000 | 00bc |
| 3062340 | b288 | b66c | 0000 | 0ef3 | 7fff | ffff | 0015 | a650 | 0200 | 0db5 | 0100 | 15ad | 0100 | 33fd | 0000 | 000b | 0000 | 315f | 0014 | 4dc4 | 0000 | 002c | b288 | b66c |
| 3062420 | 0000 | 0ef3 | 7fff | ffff | 0014 | 4d70 | 0200 | 0db5 | 0100 | 15ad | 0100 | 33fd | 0000 | 000b | 0000 | 315f | 0014 | 4df0 | 0000 | 002c | b288 | b66c | 0000 | 0ef3 |
| 3062500 | 7fff | ffff | 0014 | 4d9c | 0200 | 0db5 | 0100 | 15ad | 0100 | 33fd | 0000 | 000b | 0000 | 315f | 0014 | 5138 | 0000 | 0038 | b27c | b66c | 0000 | 0ef4 | 0000 | 0f13 |
| 3062560 | 0014 | 513c | 0200 | 0db5 | 0500 | 1cdd | 0000 | 715f | 0000 | 001b | 0000 | 70af | 00ad | 3343 | 0000 | 03b3 | 0000 | 315f | 27f0 | 00a4 | 0014 | 4ec8 | 5d10 | 0000 |
| 3062640 | 0200 | 710f | 687c | 001c | 6af0 | 0020 | 5d7c | 0000 | 0200 | 710f | 6a50 | 6aa0 | 5de8 | 0000 | 0200 | 710f | 69b0 | 6a00 | 3050 | 9300 | 93a8 | 0026 | 3930 | 0020 |
| 3062720 | 3914 | 001c | 3968 | 0018 | 38d4 | 41fc | 0000 | 000b | 382c | 0020 | 37c4 | 001c | 242c | 0000 | 0015 | a638 | 9328 | 93a8 | 0024 | 3968 | 0020 | 394c | 001c | 3984 |
| 3063000 | 0018 | 0020 | 38fc | 001c | 4268 | 0000 | ffff | fffb | 2410 | 0000 | 0015 | a638 | 3984 | 0020 | 0020 | 3984 | 001c | 001c | 3968 | 0018 | 38d4 | 41fc | ffff | fffb |
| 3063060 | 2410 | 0000 | 0015 | a638 | 28c4 | 013c | 0014 | 5004 | 5d10 | 0000 | 0200 | 710f | 682c | 6a00 | 5d7c | 0000 | 0300 | 70af | 6af0 | 0020 | 6af0 | 0024 | 6af0 | 0028 |
| 3063140 | 5de8 | 0000 | 0300 | 70af | 6a50 | 6aa0 | 6af0 | 001c | 3050 | 9328 | 93a8 | 0056 | 4224 | 003c | 0000 | 0003 | 4224 | 0038 | 0000 | 0003 | 4224 | 0034 | 0000 | 0003 |
| 3063220 | 3984 | 0030 | 001c | 3968 | 002c | 394c | 0028 | 4290 | 0000 | 0024 | 0000 | 0003 | 4224 | 0020 | 0000 | 0003 | 4224 | 001c | 0000 | 0003 | 3984 | 0018 | 0028 | 38fc |
| 3063300 | 0024 | 3894 | 0020 | 2330 | 0015 | a6b8 | 9350 | 0020 | 93a8 | 0052 | 4224 | 003c | 0000 | 0003 | 4224 | 0038 | 0000 | 0003 | 4224 | 0034 | 0000 | 0003 | 3984 | 0030 |
| 3063360 | 0028 | 3984 | 002c | 0024 | 3984 | 0020 | 0020 | 4290 | 0000 | 0024 | 0000 | 0001 | 4224 | 0020 | 0000 | 0003 | 4224 | 001c | 0000 | 0003 | 3984 | 0018 | 001c | 2304 |
| 3063440 | 0015 | a6d8 | 4224 | 003c | 0000 | 0003 | 4224 | 0038 | 0000 | 0003 | 4224 | 0034 | 0000 | 0003 | 3984 | 0030 | 0028 | 3984 | 002c | 0024 | 3984 | 0028 | 0020 | 4290 |
| 3063520 | 0000 | 0024 | 0000 | 0003 | 4224 | 0020 | 0000 | 0003 | 4224 | 001c | 0000 | 0003 | 3984 | 0018 | 001c | 2304 | 0015 | a6f8 | 2954 | 0130 | 0002 | 438a | 5d10 | 0000 |
| 3063600 | 0200 | 710f | 682c | 6a00 | 5d7c | 0000 | 0600 | 70e7 | 6af0 | 002c | 6af0 | 0030 | 6af0 | 0034 | 6af0 | 0038 | 6af0 | 003c | 6af0 | 0040 | 5de8 | 0000 | 0600 | 70af |
| 3063660 | 6a50 | 6aa0 | 6af0 | 001c | 6af0 | 0020 | 6af0 | 0024 | 6af0 | 0028 | 3050 | 9328 | 93a8 | 004a | 3984 | 003c | 0028 | 3984 | 0038 | 0024 | 3984 | 0034 | 0020 | 3984 |
| 3063740 | 0030 | 001c | 3968 | 002c | 394c | 0028 | 3984 | 0024 | 0040 | 3984 | 0020 | 003c | 3984 | 001c | 0038 | 3984 | 0018 | 0034 | 38fc | 0030 | 3894 | 002c | 2410 | 0000 |
| 3064020 | 0015 | a6b8 | 9350 | 002c | 93a8 | 0046 | 3984 | 003c | 0040 | 3984 | 0038 | 003c | 3984 | 0034 | 0038 | 3984 | 0030 | 0034 | 3984 | 002c | 0030 | 3984 | 0028 | 002c |
| 3064100 | 3984 | 0024 | 0028 | 3984 | 0020 | 0024 | 3984 | 001c | 0020 | 3984 | 0018 | 001c | 23e4 | 0000 | 0015 | a6d8 | 3984 | 003c | 0040 | 3984 | 0038 | 003c | 3984 | 0034 |
| 3064160 | 0038 | 3984 | 0030 | 0034 | 3984 | 002c | 0030 | 3984 | 0028 | 002c | 3984 | 0024 | 0028 | 3984 | 0020 | 0024 | 3984 | 001c | 0020 | 3984 | 0018 | 001c | 23e4 | 0000 |
| 3064240 | 0015 | a6f8 | 0014 | 5228 | 0000 | 0038 | b27c | b66c | 0000 | 0ef5 | 0000 | 0f14 | 0014 | 522c | 0200 | 0db5 | 0500 | 1cdd | 0000 | 7177 | 0000 | 0073 | 0000 | 70af |
| 3064320 | 00ad | 35c3 | 0000 | 03b3 | 0000 | 315f | 2c78 | 00b8 | 0002 | 438a | 45e8 | 0034 | 4728 | 0038 | 3588 | 3600 | 3678 | 0018 | 36dc | 001c | 3754 | 0018 | 0020 | 3754 |
| 3064400 | 001c | 0024 | 4848 | 0028 | 4864 | 002c | 4880 | 0030 | 001c | 4880 | 0034 | 0020 | 4880 | 0038 | 0024 | 4880 | 003c | 0028 | 3540 | 0024 | 0030 | 3540 | 0020 | 002c |
| 3064460 | 24d0 | 0000 | 0015 | 838c | 003c | 34e0 | 0020 | 34c0 | 001c | 3984 | 0018 | 0038 | 38fc | 0034 | 4268 | 0000 | 0000 | 000b | 3e70 | 0030 | 40b4 | 002c | 0015 | a638 |
| 3064540 | 002c | 3984 | 0028 | 0028 | 3984 | 0024 | 0024 | 3984 | 0020 | 0020 | 3984 | 001c | 001c | 3968 | 0018 | 38d4 | 3d60 | 3d24 | 4240 | 0000 | 0000 | 000b | 242c | 0000 |
| 3064620 | 0015 | 8348 | 0014 | 5318 | 0000 | 0039 | b27c | b66c | 0000 | 0ef6 | 0000 | 0f15 | 0014 | 531c | 0200 | 0db5 | 0500 | 1cdd | 0000 | 717f | 0000 | 0073 | 0000 | 70af |
| 3064700 | 00ad | 36c3 | 0000 | 03b3 | 0000 | 315f | 2c78 | 00b8 | 0002 | 438a | 45e8 | 0034 | 4728 | 0038 | 3588 | 3600 | 3678 | 0018 | 36dc | 001c | 3754 | 0018 | 0020 | 3754 |
| 3064760 | 001c | 0024 | 4848 | 0028 | 4864 | 002c | 4880 | 0030 | 001c | 4880 | 0034 | 0020 | 4880 | 0038 | 0024 | 4880 | 003c | 0028 | 3540 | 0024 | 0030 | 3540 | 0020 | 002c |
| 3065040 | 24d0 | 0000 | 0015 | 838c | 003c | 34e0 | 0020 | 34c0 | 001c | 3984 | 0018 | 0038 | 38fc | 0034 | 4268 | 0000 | ffff | fffb | 3e70 | 0030 | 40b4 | 002c | 0015 | a638 |
| 3065120 | 002c | 3984 | 0028 | 0028 | 3984 | 0024 | 0024 | 3984 | 0020 | 0020 | 3984 | 001c | 001c | 3968 | 0018 | 38d4 | 3d60 | 3d24 | 4240 | 0000 | 0000 | 000b | 242c | 0000 |
| 3065200 | 0015 | 8348 | 0014 | 5c78 | 0000 | 0038 | b130 | b66c | 0000 | 0ef7 | 0000 | 0f16 | 0014 | 3a81 | 0200 | 0db5 | 0500 | 1cdd | 0000 | 7187 | 0000 | 0073 | 0000 | 70af |
| 3065260 | 00ad | 37c3 | 0000 | 03b3 | 0000 | 315f | 2c78 | 00b0 | 0002 | 438a | 45e8 | 001c | 4728 | 0020 | 4790 | 0024 | 47f8 | 0028 | 4880 | 0018 | 002c | 4880 | 001c | 0030 |
| 3065340 | 4880 | 0020 | 0034 | 4880 | 0024 | 0038 | 35b0 | 0028 | 3614 | 002c | 3678 | 0030 | 36dc | 0034 | 3754 | 0018 | 0038 | 3754 | 001c | 003c | 3520 | 0024 | 3500 | 0020 |
| 3065420 | 24d0 | 0000 | 0015 | 838c | 003c | 34e0 | 0024 | 34c0 | 0020 | 3984 | 001c | 0038 | 3984 | 0018 | 0034 | 38fc | 0030 | 3894 | 002c | 382c | 0028 | 3c9c | 0000 | 0024 |
| 3065500 | 0015 | 838c | 0024 | 3984 | 0020 | 0020 | 3984 | 001c | 001c | 31e4 | 0018 | 3d9c | 4268 | 0000 | ffff | fffb | 3d30 | 3cf4 | 242c | 0000 | 0015 | a638 | 0015 | 8338 |
| 3065560 | 0100 | 70af | 0000 | 3287 | 0000 | 0004 | 0014 | 8a18 | 0014 | 8a18 | 0041 | 0000 | 0000 | 0000 | 0014 | 8c30 | 0013 | c048 | 0000 | 6e3f | b328 | 542c | 0013 | eac8 |

```
3065640  0000 0000 0015 581c 0000 0000 000a fe3c 0000 0000 0011 66d0 0200 6e67 0000 6e3f 0000 0008 0013 af30 0013 af30 0001 0075
3065720  0000 0000 0000 6e67 b328 0203 0013 eaf4 0000 0000 0014 5464 000f 6078 0011 6754 0200 6e6f 0000 6e3f 0000 0008 0014 8948
3066000  0014 8960 0001 0075 0000 0000 0000 6e5f b328 17a7 0013 eb28 0000 0000 0014 549c 000f 60b0 0011 680c 0200 6e77 0000 6e3f
3066060  0000 0008 0014 0790 0014 0790 0001 0075 0000 0000 0000 6e77 b328 0ad7 0013 eb5c 000c 0000 0014 54d4 000f 60f0 0011 6894
3066140  0300 6e7f 0000 6e3f 0000 000c 0014 0610 0013 e4e4 0001 0075 0000 0000 0000 6e7f b464 5519 0013 eb90 000d 4a08 0014 550c
3066220  000f 6128 0014 54ec 0400 6e7f 0000 6e3f 0000 0010 0013 e560 0013 e5b0 0001 0075 0000 0000 0012 02ac 0300 6e87 0000 6e3f
3066300  0000 000c 0014 017c 0014 017c 0001 0075 0000 0000 0000 6e87 b328 17a7 0013 ebf8 0000 0000 000f 6150 0000 0000 0014 5564
3066360  0014 5574 0011 6918 0200 6e8f 0000 6e3f 0000 0008 0013 fd08 0013 fd08 0001 0075 0000 0000 0000 6e8f b464 17a7 0013 ec2c
3066440  000d 4a14 000f 6190 0000 0000 0014 55a4 0014 55b4 0014 5584 0300 6e8f 0000 6e3f 0000 000c 0013 ff54 0013 ff54 0001 0075
3066520  000c 000c 0011 697c 0200 6e97 0000 6e3f 0000 0008 0014 7f58 0014 7f58 0001 0075 0000 0000 0000 6e97 b464 aee5 0013 ec94
3066600  000d 4d80 0014 5604 000f 61e0 0014 55e4 0300 6e97 0000 6e3f 0000 000c 0014 8140 0014 8140 0001 0075 0000 0000 000c 63e4
3066660  0200 6e9f 0000 6e3f 0000 0008 0013 fdac 0013 fdac 0001 0075 0000 0000 0000 6e9f b464 567e 0013 ecfc 0011 736c 0014 563c
3066740  0300 6e9f 0000 6e3f 0000 000c 0013 ffbc 0013 ffbc 0001 0075 0000 0000 0010 1e10 0100 6ea7 0000 6e3f 0000 0004 0014 8914
3067020  0014 8914 0001 0075 0000 0000 0000 6ea7 b464 17a7 0013 ed64 000d 4a20 0014 56ac 000f 85b8 0014 560c 0200 6ea7 0000 6e3f
3067100  0000 0008 0013 e2ec 0013 e2ec 0001 0075 0000 0000 0012 7318 0300 6eaf 0000 6e3f 0000 000c 0014 8434 0014 8434 0001 0075
3067160  0000 0000 0000 6eaf b328 0ad7 0013 edcc 0000 0000 0014 5704 000f 8628 000c 6474 0300 6eb7 0000 6e3f 0000 000c 0014 8560
3067240  0014 8560 0001 0075 0000 0000 0000 6eb7 b464 0013 0013 ee00 000d 4a2c 0014 571c 0400 6eb7 0000 6e3f 0000 0010 0014 8584
3067320  0014 8584 0001 0075 0000 0000 0014 574c 0500 6eb7 0000 6e3f 0000 0014 0014 85a8 0014 85a8 0001 0075 0000 0000 0014 576c
3067400  0600 6eb7 0000 6e3f 0000 0018 0013 d9fc 0013 db58 0001 0075 0000 0000 0011 61bc 0100 2927 0000 6e3f 0000 0004 0014 7de8
3067460  0014 7de8 0001 0075 0000 0000 0012 3a90 0200 6ebf 0000 6e3f 0000 0008 0013 add0 0013 add0 0001 0075 0000 0000 0000 6ebf
3067540  b328 57d9 0013 ef04 0000 0000 000c 6534 0300 6ec7 0000 6e3f 0000 000c 0014 0690 0014 0718 0001 0075 0000 0000 0000 6ec7
3067620  b328 0003 0013 ef38 0000 0000 000e 8150 0200 6ecf 0000 6e3f 0000 0008 0013 affc 0013 affc 0001 0075 0000 0000 0000 6ecf
3067700  b328 0ad7 0013 ef6c 0000 0000 000a 3598 0000 0000 0014 584c 0014 585c 0011 5690 0300 6ed7 0000 6e3f 0000 000c 0014 8774
3067760  0014 8774 0001 0075 0000 0000 0000 6ed7 b464 58ae 0013 efa0 000d 4d2c 000f 82c8 0000 0000 0014 588c 0014 589c 0014 586c
3070040  0400 6ed7 0000 6e3f 0000 0010 0014 8794 0014 8794 0001 0075 0000 0000 0014 58ac 0500 6ed7 0000 6e3f 0000 0014 0013 df60
3070120  0013 df60 0001 0075 0000 0000 0011 4904 0300 6edf 0000 6e3f 0000 000c 0014 881c 0014 881c 0001 0075 0000 0000 0000 6edf
3070200  b464 5919 0013 f03c 0012 8368 0014 590c 000f 8310 0014 58ec 0400 6edf 0000 6e3f 0000 0010 0014 8840 0014 8840 0001 0075
3070260  0000 0000 0014 5924 0500 6edf 0000 6e3f 0000 0014 0013 e05c 0013 e05c 0001 0075 0000 0000 0012 7634 0200 6ee7 0000 6e3f
3070340  0000 0008 0014 8874 0014 8874 0001 0075 0000 0000 0000 6ee7 b464 17a7 0013 f0d8 000d 4cf0 000f 8338 0000 0000 0014 5984
3070420  0014 5994 0014 5964 0300 6ee7 0000 6e3f 0000 000c 0013 e120 0013 e120 0001 0075 0000 0000 0014 59a4 0500 6ee7 0000 6e3f
3070500  0000 0014 0013 e188 0013 e188 0001 0075 0000 0000 0012 016c 0100 2fdf 0000 6e3f 0000 0004 0010 a584 0010 a584 0001 0075
3070560  0000 0000 0000 2fdf b328 c955 0013 f174 0000 0000 0013 7c18 0300 6eef 0000 6e3f 0000 000c 0014 027c 0014 045c 0001 0075
3070640  0000 0000 0000 6eef b328 5a41 0013 f1a8 0000 0000 000f 8378 0000 0000 0014 5a34 0014 5a44 0012 71b8 0300 6ef7 0000 6e3f
3070720  0000 000c 0014 052c 0014 0598 0001 0075 0000 0000 0000 6ef7 b328 007b 0013 f1dc 0000 0000 0014 5a74 000f 83c8 0012 71d8
3071000  0200 6eff 0000 6e3f 0000 0008 0013 b12c 0013 b12c 0001 0075 0000 0000 0000 6eff b328 17a7 0013 f210 0000 0000 000f 83f0
3071060  0000 0000 0014 5aac 0014 5abc 0012 7218 0200 6f07 0000 6e3f 0000 0008 0014 8324 0014 8338 0001 0075 0000 0000 0000 6f07
3071140  b328 cb51 0013 f244 0000 0000 000f 8430 0000 0000 0014 5aec 0014 5afc 0012 7258 0300 6f0f 0000 6e3f 0000 000c 0014 8464
3071220  0014 8464 0001 0075 0000 0000 0000 6f0f b328 c815 0013 f278 0000 0000 000f 8490 0000 0000 0014 5b2c 0014 5b3c 0012 7278
3071300  0200 6f17 0000 6e3f 0000 0008 0015 3258 0015 3259 0021 0000 0000 0000 0000 6f17 b328 5b55 0013 f2ac 0000 0000 000f 84f0
3071360  0000 0000 0014 5b6c 0014 5b7c 0012 7298 0400 6f1f 0000 6e3f 0000 0010 0014 8504 0014 8504 0001 0075 0000 0000 0000 6f1f
3071440  b464 5b99 0013 f2e0 000d 4978 0014 5bac 000f 8540 0014 5b8c 0500 6f1f 0000 6e3f 0000 0014 0013 d7bc 0013 d7bc 0001 0075
3071520  0000 0000 0012 72b8 0400 6f27 0000 6e3f 0000 0010 0014 8494 0014 8494 0001 0075 0000 0000 0000 6f27 b464 5c11 0013 f348
3071600  000b 80d4 000f 8568 0000 0000 0014 5c04 0014 5c14 0014 5be4 0500 6f27 0000 6e3f 0000 0014 0013 d510 0013 d694 0001 0075
3071660  0000 0000 0012 0f44 0100 3037 0000 6e3f 0000 0004 0013 fca4 0013 fca4 0001 0075 0000 0000 0000 3037 b328 0013 0013 f3b0
3071740  0000 0000 0014 8eac 0000 2008 0000 0000 0000 0000 0000 0000 0000 0000 0014 8a74 0014 8ad0 0014 88a8 0000 0000
3072020  0000 0000 0014 8a08 0013 fe4d 0000 0000 0014 897c 0000 0000 0000 0000 0000 0000 0000 0000 0014 8904 0000 0000 0000 0000
3072100  0014 89b8 0000 0000 0014 8a19 000e 4411 0014 8815 0014 8864 0000 0000 0000 0000 0014 8a28 0014 8eac 0000 1f88 7228 293b
3072160  0a65 7874 6572 6e20 696e 7420 5173 7973 7465 6d28 293b 0a65 7874 6572 6e20 696e 7420 5163 6d70 7374 7228 293b 0a65 7874
3072240  6572 6e20 696e 7420 5161 746f 6363 6828 293b 0a65 7874 6572 6e20 696e 7420 5163 6861 746f 6d28 293b 0a65 7874 6572 6e20
3072320  696e 7420 516f 7574 6368 6b28 293b 0a65 7874 6572 6e20 696e 7420 516f 7574 7374 7228 293b 0a65 7874 6572 6e20 696e 7420
3072400  5169 6e64 6578 2829 3b0a 6578 7465 726e 2069 6e74 2051 7370 616e 2829 3b0a 6578 7465 726e 2069 6e74 2051 7041 746f 6d28
3072460  293b 0a65 7874 6572 6e20 696e 7420 5170 496e 6974 2829 3b0a 6578 7465 726e 2069 6e74 2051 7046 6f75 7228 293b 0a65 7874
3072540  6572 6e20 696e 7420 5170 4f6e 6528 293b 0a65 7874 6572 6e20 696e 7420 5170 496e 7428 293b 0a65 7874 6572 6e20 696e 7420
3072620  5170 466c 7428 293b 0a65 7874 6572 6e20 696e 7420 5167 4174 6f6d 2829 3b0a 6578 7465 726e 2069 6e74 2051 6749 6e69 7428
3072700  293b 0a65 7874 6572 6e20 696e 7420 5167 466f 7572 2829 3b0a 6578 7465 726e 2069 6e74 2051 674f 6e65 2829 3b0a 6578 7465
```

```
3072760 726e 2069 6e74 2051 674e 756d 2829 3b0a 6578 7465 726e 2069 6e74 2051 7050 6172 7428 293b 0a65 7874 6572 6e20 696e 7420
3073040 5169 6e73 7374 7228 293b 0a0a 696e 7420 282a 2851 505f 4c35 5b5d 2929 2829 203d 207b 0a20 2020 2020 2020 2051 7374 726c
3073120 656e 2c0a 2020 2020 2020 2020 5173 7472 6368 722c 0a20 2020 2020 2020 2051 7375 6263 686b 2c0a 2020 2020 2020 2020 5173
3073200 7562 7374 722c 0a20 2020 2020 2020 2051 7379 7374 656d 2c0a 2020 2020 2020 2020 5163 6d70 7374 722c 0a20 2020 2020 2020
3073260 2051 6174 6f6d 6368 2c0a 2020 2020 2020 2020 5163 6861 746f 6d2c 0a20 2020 2020 2020 2051 6f75 7463 686b 2c0a 2020 2020
3073340 2020 2020 516f 7574 7374 722c 0a20 2020 2020 2020 2051 696e 6465 782c 0a20 2020 2020 2020 2051 7370 616e 2c0a 2020 2020
3073420 2020 2020 5170 4174 6f6d 2c0a 2020 2020 2020 2020 5170 496e 6974 2c0a 2020 2020 2020 2020 5170 466f 7572 2c0a 2020 2020
3073500 2020 2020 5170 4f6e 652c 0a20 2020 2020 2020 2051 7049 6e74 2c0a 2020 2020 2020 2020 5170 466c 742c 0a20 2020 2020 2020
3073560 2051 6741 746f 6d2c 0a20 2020 2020 2020 2051 6749 6e69 742c 0a20 2020 2020 2020 2051 6746 6f75 722c 0a20 2020 2020 2020
3073640 2051 674f 6e65 2c0a 2020 2020 2020 2020 5167 4e75 6d2c 0a20 2020 2020 2020 2051 7050 6172 742c 0a20 2020 2020 2020 2051
3073720 696e 7373 7472 2c0a 3020 7d3b 0a6e 7428 582c 094e 2c20 476f 616c 290a 096d 7573 745f 6265 5f63 616c 6c61 626c 6528 582c
3074000 094e 2c20 476f 616c 290a 096d 7573 745f 6265 5f6e 6f6e 7661 7228 582c 094e 2c20 476f 616c 290a 096d 7573 745f 6265 5f76
3074060 6172 2858 2c09 094e 2c20 476f 616c 290a 096d 7573 745f 6265 5f67 726f 756e 6428 582c 094e 2c20 476f 616c 290a 096d 7573
3074140 745f 6265 5f6f 6e65 6f66 2858 2c20 4c2c 094e 2c20 476f 616c 290a 096d 7573 745f 6265 5f6e 6f6e 6e65 6728 582c 094e 2c20
3074220 476f 616c 290a 096d 7573 745f 6265 5f70 726f 7065 725f 6c69 7374 2858 2c20 204e 2c20 476f 616c 290a 096d 7573 745f 6265
3074300 5f63 6861 7273 2858 2c09 4e2c 2047 6f61 6c29 0a09 6d75 7374 5f62 655f 6265 7477 6565 6e28 582c 204c 2c55 2c09 4e2c 2047
3074360 6f61 6c29 0a0a 2020 2020 7768 6963 6820 6368 6563 6b20 666f 7220 6120 636f 6e64 6974 696f 6e20 616e 6420 7265 706f 7274
3074440 2061 2075 7365 6675 6c20 6d65 7373 6167 6520 6966 2074 6865 0a20 2020 2061 7267 756d 656e 7420 6861 7320 7468 6520 7772
3074520 6f6e 6720 7479 7065 2e20 2054 6865 2069 6465 6120 6973 2074 6861 7420 6172 6728 4e2c 476f 616c 2c58 2920 6973 0a20 2020
3074600 2073 7570 706f 7365 6420 746f 2062 6520 7472 7565 2e0a 0a09 2a2a 2a20 5468 6973 2066 696c 6520 6973 2075 6e73 7570 706f
3074660 7274 6564 2069 6e20 7468 6520 7365 6e73 6520 7468 6174 2069 7420 6973 206d 6561 6e74 0a09 2a2a 2a20 666f 7220 7573 6520
3074740 6f6e 6c79 2062 7920 5175 696e 7475 732e 2020 5468 6520 6661 6374 2074 6861 7420 6c69 6272 6172 7920 6669 6c65 730a 092a
3075020 2a2a 2077 6869 6368 2075 7365 2074 6869 7320 6669 6c65 2067 656e 6572 6174 6520 6572 726f 7220 7265 706f 7274 7320 7769
3075100 6c6c 206e 6f74 2062 650a 092a 2a2a 2063 6861 6e67 6564 2c20 6275 7420 7468 6520 6d61 6e6e 6572 2069 6e20 7768 6963 6820
3075160 6572 726f 7273 2061 7265 2064 6574 6563 7465 6420 260a 092a 2a2a 2072 6570 6f72 7465 6420 6973 206c 696b 656c 7920 746f
3075240 2063 6861 6e67 6520 4452 414d 4154 4943 414c 4c59 2062 6566 6f72 6520 6c6f 6e67 2e0a 092a 2a2a 2046 6565 6c20 6672 6565
3075320 2074 6f20 7573 6520 7468 6973 2073 7475 6666 2c20 6275 7420 6265 2070 7265 7061 7265 6420 666f 7220 6974 2074 6f0a 092a
3075400 2a2a 2062 6520 7265 706c 6163 6564 2062 7920 736f 6d65 7468 696e 6720 6d75 6368 2062 6574 7465 7221 0a0a 2020 2020 5468
3075460 6520 6368 6563 6b73 206d 7573 745f 6265 5f78 7878 2061 7265 206e 6f74 206d 6561 6e74 2066 6f72 2059 4f55 5220 7573 652c
3075540 2062 7574 2066 6f72 204f 5552 532e 0a20 2020 204f 7468 6572 206c 6962 7261 7279 2066 696c 6573 2075 7365 2074 6865 6d20
3075620 746f 2064 6f20 6572 726f 7220 6368 6563 6b69 6e67 2e20 2059 6f75 2073 686f 756c 646e 2774 0a20 2020 2072 656c 7920 6f6e
3075700 2074 6865 6d2c 2062 6563 6175 7365 2069 6e20 7468 6520 6e65 7874 2072 656c 6561 7365 206f 6620 7468 6520 6c69 6272 6172
3075760 792c 2065 7272 6f72 0a20 2020 2063 6865 636b 696e 6720 6d61 7920 6265 2064 6f6e 6520 696e 2061 2063 6f6d 706c 6574 656c
3076040 7920 6469 6666 6572 656e 7420 7761 792e 2020 5468 6520 6d61 696e 2072 6561 736f 6e0a 2020 2020 666f 7220 6861 7669 6e67
3076120 2074 6869 7320 6669 6c65 2c20 6170 6172 7420 6672 6f6d 2064 6566 696e 696e 6720 6120 636f 6c6c 6563 7469 6f6e 206f 6620
3076200 7479 7065 2074 6573 7473 0a20 2020 2077 6869 6368 2061 7265 2075 7365 6675 6c20 696e 2074 6865 6972 206f 776e 2072 6967
3076260 6874 2c20 6973 2074 6f20 7072 6f76 6964 6520 6120 7365 7420 6f66 2063 6865 636b 730a 2020 2020 7468 6174 2049 2063 616e
3076340 2070 7574 2069 6e74 6f20 6d79 2063 6f64 6520 736f 2074 6861 7420 4920 646f 2073 6f6d 6574 6869 6e67 2073 656e 7369 626c
3076420 6520 696e 2074 6865 0a20 2020 2065 7665 6e74 206f 6620 616e 2065 7272 6f72 2c20 736f 2074 6861 7420 7768 656e 2073 6f6d
3076500 6574 6869 6e67 2062 6574 7465 7220 6973 2064 6573 6967 6e65 6420 4920 7769 6c6c 0a20 2020 2068 6176 6520 6578 6973 7469
3076560 6e67 2063 6f64 6520 746f 2075 7064 6174 6520 7261 7468 6572 2074 6861 6e20 6861 7669 6e67 2074 6f20 676f 2074 6872 6f75
3076640 6768 2061 6e64 0a20 2020 2069 6e73 7461 6c6c 2063 6f6d 706c 6574 656c 7920 6e65 7720 636f 6465 2e0a 0a20 2020 204e 6f74
3076720 6520 7468 6174 2061 6c74 686f 7567 6820 6f6e 6520 6f66 2074 6865 2061 7267 756d 656e 7473 206f 6620 7468 6573 6520 726f
3077000 7574 696e 6573 2069 730a 2020 2020 6465 7363 7269 6265 6420 6173 2061 2022 676f 616c 222c 2077 6520 6172 6520 4e4f 5420
3077060 676f 696e 6720 746f 2063 616c 6c20 6974 2c20 616e 6420 6974 2077 6f75 6c64 0a20 2020 206f 6e6c 7920 6d61 6b65 2074 6869
3077140 6e67 7320 6d6f 7265 206f 6273 6375 7265 2074 6f20 6465 636c 6172 6520 7468 6573 6520 7072 6564 6963 6174 6573 2061 730a
3077220 2020 2020 6d65 7461 5f70 7265 6469 6361 7465 732e 2020 5765 2061 7265 206a 7573 7420 676f 696e 6720 746f 2070 7269 6e74
3077300 2074 686f 7365 2022 676f 616c 7322 2e0a 2a2f 0a0a 3a2d 206d 6f64 756c 6528 7479 7065 732c 205b 0a09 6361 6c6c 6162 6c65
3077360 2f31 2c0a 0963 6861 7273 2f31 2c0a 2020 2020 2f2a 0963 6f6d 706c 6578 2f31 2c09 0909 2520 666f 7220 7468 6520 6675 7475
3077440 7265 092a 2f0a 0963 6f6d 706f 756e 642f 312c 0a09 636f 6e73 7461 6e74 2f31 2c0a 0967 726f 756e 642f 312c 0a09 7072 6f70
3077520 6572 5f6c 6973 742f 312c 0a20 2020 202f 2a09 7261 7469 6f6e 616c 2f31 2c09 0909 2520 666f 7220 7468 6520 6675 7475 7265
3077600 092a 2f0a 0973 696d 706c 652f 312c 0a20 2020 202f 2a09 7374 7269 6e67 2f31 2c09 0909 2520 666f 7220 7468 6520 6675 7475
3077660 7265 092a 2f0a 0973 796d 626f 6c2f 312c 0a09 7465 726d 5f74 7970 652f 322c 0a09 6d75 7374 5f62 652f 332c 0a09 6d75 7374
3077740 5f62 652f 342c 0a09 7368 6f75 6c64 5f62 652f 332c 0a09 7368 6f75 6c64 5f62 652f 342c 0a20 2020 202f 2a09 0909 5448 4520
3100020 5245 5354 2041 5245 204f 4253 4f4c 4553 4345 4e54 0909 2a2f 0a09 6d75 7374 5f62 655f 6174 6f6d 2f33 2c0a 096d 7573 745f
```

```
3100100 6265 5f62 6574 7765 656e 2f35 2c0a 096d 7573 745f 6265 5f63 616c 6c61 626c 652f 332c 0a09 6d75 7374 5f62 655f 6368 6172
3100160 732f 332c 0a09 6d75 7374 5f62 655f 636f 6d70 6f75 6e64 2f33 2c0a 096d 7573 745f 6265 5f63 6f6e 7374 616e 742f 332c 0a09
3100240 6d75 7374 5f62 655f 6772 6f75 6e64 2f33 2c0a 096d 7573 745f 6265 5f69 6e74 6567 6572 2f33 2c0a 096d 7573 745f 6265 5f6e
3100320 6f6e 6e65 672f 332c 0a09 6d75 7374 5f62 655f 6e6f 6e76 6172 2f33 2c0a 096d 7573 745f 6265 5f6e 756d 6265 722f 332c 0a09
3100400 6d75 7374 5f62 655f 6f6e 656f 662f 342c 0a09 6d75 7374 5f62 655f 7072 6f70 6572 5f6c 6973 742f 332c 0a09 6d75 7374 5f62
3100460 655f 7379 6d62 6f6c 2f33 2c0a 096d 7573 745f 6265 5f76 6172 2f33 0a20 2020 5d29 2e0a 0a73 6363 735f 6964 2827 2240 2823
3100540 2938 392f 3039 2f31 3120 7479 7065 732e 706c 0933 342e 3222 2729 2e0a 0a0a 0a63 616c 6c61 626c 6528 5465 726d 2920 3a2d
3100620 0a09 6e6f 6e76 6172 2854 6572 6d29 2c0a 0966 756e 6374 6f72 2854 6572 6d2c 2053 796d 626f 6c2c 205f 4172 6974 7929 2c0a
3100700 0961 746f 6d28 5379 6d62 6f6c 292e 0a0a 0a63 6f6d 706f 756e 6428 5465 726d 2920 3a2d 0a09 6e6f 6e76 6172 2854 6572 6d29
3100760 2c0a 0966 756e 6374 6f72 2854 6572 6d2c 205f 5379 6d62 6f6c 2c20 4172 6974 7929 2c0a 0941 7269 7479 203e 2030 2e0a 0a0a
3101040 636f 6e73 7461 6e74 2854 6572 6d29 203a 2d09 0909 2520 5072 6f62 6162 6c79 2074 6865 2073 616d 6520 6173 2061 746f 6d69
3101120 6328 5465 726d 292c 0a09 6e6f 6e76 6172 2854 6572 6d29 2c09 0909 2520 6275 7420 4927 6d20 706c 6179 696e 6720 7361 6665
3101200 2068 6572 652e 0a09 6675 6e63 746f 7228 5465 726d 2c20 5465 726d 2c20 3029 2e09 0925 2061 746f 6d69 6320 7761 7320 6465
3101260 6669 6e65 6420 6173 2069 6e74 6567 6572 7c61 746f 6d0a 0a0a 6772 6f75 6e64 2854 6572 6d29 203a 2d0a 096e 6f6e 7661 7228
3101340 5465 726d 292c 0a09 6675 6e63 746f 7228 5465 726d 2c20 5f2c 2041 7269 7479 292c 0a09 6772 6f75 6e64 2841 7269 7479 2c20
3101420 5465 726d 292e 0a0a 6772 6f75 6e64 284e 2c20 5465 726d 2920 3a2d 0a20 2020 2028 094e 203d 3a3d 2030 202d 3e20 7472 7565
3101500 0a20 2020 203b 0961 7267 284e 2c20 5465 726d 2c20 4172 6729 2c0a 096e 6f6e 7661 7228 4172 6729 2c0a 0966 756e 6374 6f72
3101560 2841 7267 2c20 5f2c 2041 7269 7479 292c 0a09 6772 6f75 6e64 2841 7269 7479 2c20 4172 6729 2c0a 094d 2069 7320 4e2d 312c
3101640 0a09 6772 6f75 6e64 284d 2c20 5465 726d 290a 2020 2020 292e 0a0a 0a70 726f 7065 725f 6c69 7374 282a 2920 3a2d 2021 2c20
3101720 6661 696c 2e09 0925 2063 6174 6368 6573 2076 6172 6961 626c 6573 0a70 726f 7065 725f 6c69 7374 285b 5d29 2e0a 7072 6f70
3102000 6572 5f6c 6973 7428 5b5f 7c4c 5d29 203a 2d0a 0970 726f 7065 725f 6c69 7374 284c 292e 0a0a 0a73 696d 706c 6528 5465 726d
3102060 2920 3a2d 0a20 2020 2028 0976 6172 2854 6572 6d29 202d 3e20 7472 7565 0a20 2020 203b 0966 756e 6374 6f72 2854 6572 6d2c
3102140 2054 6572 6d2c 2030 290a 2020 2020 292e 0a0a 0a73 796d 626f 6c28 5465 726d 2920 3a2d 0a09 6174 6f6d 2854 6572 6d29 2e0a
3102220 0a0a 2520 2020 7465 726d 5f74 7970 6528 2b54 6572 6d2c 203f 5479 7065 290a 2520 2020 6973 2061 2074 7970 6520 7465 7374
3102300 696e 6720 7072 6564 6963 6174 6520 6465 7369 676e 6564 2066 6f72 2069 6e63 6f72 706f 7261 7469 6f6e 2069 6e74 6f20 636f
3102360 726f 7574 696e 696e 670a 2520 2020 5072 6f6c 6f67 7320 6c69 6b65 204d 5520 5072 6f6c 6f67 2061 6e64 204e 5520 5072 6f6c
3102440 6f67 2020 2049 6e20 6765 6e65 7261 6c2c 2074 6865 2072 756c 6520 6973 2074 6861 7420 7768 656e 0a25 2020 2061 2070 7265
3102520 6469 6361 7465 202a 776f 756c 642a 2064 656c 6179 2069 6e20 6120 636f 726f 7574 696e 696e 6720 7379 7374 656d 2c20 6974
3102600 202a 6d75 7374 2a20 7265 706f 7274 2061 6e0a 2520 2020 696e 7374 616e 7469 6174 696f 6e20 6661 756c 7420 696e 2061 206e
3102660 6f6e 2d63 6f72 6f75 7469 6e69 6e67 2073 7373 7465 6d20 6c69 6b65 2051 7569 6e74 7573 2050 726f 6c6f 672e 0a25 2020 2054
3102740 6869 7320 7072 6564 6963 6174 6520 6973 206e 6f20 6578 6365 7074 696f 6e3a 2074 6865 2054 6572 6d20 6d75 7374 2062 6520
3103020 696e 7374 616e 7469 6174 6564 2077 6865 6e20 796f 750a 2520 2020 6361 6e6c 2074 6572 6d5f 7479 7065 2f32 2062 6563 6175
3103100 7365 206b 6e6f 7769 6e67 2074 6865 2054 7970 6520 646f 6573 6e27 7420 6769 7665 2079 6f75 2065 6e6f 7567 680a 2520 2020
3103160 696e 666f 726d 6174 696f 6e20 746f 2072 6563 6f6e 7374 7275 6374 2074 6865 2054 6572 6d2e 2020 4966 2079 6f75 2073 7570
3103240 706c 7920 7468 6520 5479 7065 2c20 6173 2069 6e0a 2520 2020 7465 726d 5f74 7970 6528 582c 2063 6f6e 7374 616e 7429 2c20
3103320 7468 6973 2069 7320 6120 7065 7266 6563 746c 7920 676f 6f64 206c 6f67 6963 616c 2074 6573 742e 2020 4974 2069 730a 2520
3103400 2020 6e6f 7420 6173 2066 6173 7420 6173 2061 746f 6d69 6328 5829 2077 6f75 6c64 2062 652c 2062 7574 2069 7420 6973 2022
3103460 736f 756e 6422 2e20 2049 6e20 6f72 6465 7220 746f 0a25 2020 2070 7265 7365 7276 6520 7468 6520 6c6f 6769 6361 6c20 6368
3103540 6172 6163 7465 7220 6f66 2074 6969 7320 7072 6564 6963 6174 652c 2069 6620 796f 7520 6c65 6176 6520 5479 7065 0a25 2020
3103620 2075 6e62 6f75 6e64 2c20 616c 6c20 7468 6520 7479 7065 7320 7768 6963 6820 5465 726d 2068 6173 2077 696c 6c20 6265 2065
3103700 6e75 6d65 7261 7465 642e 0a0a 7465 726d 5f74 7970 6528 5465 726d 2c20 5479 7065 2920 3a2d 0a09 2820 2020 7661 7228 5465
3103760 726d 2920 202d 3e20 696e 7374 616e 7469 6174 696f 6e5f 6661 756c 7428 312c 2074 6572 6d5f 7479 7065 2854 6572 6d2c 5479
3104040 7065 2929 0a09 3b20 2020 6174 6f6d 2854 7970 6529 202d 3e20 7465 726d 5f74 7970 655f 2854 7970 652c 2054 6572 6d29 0a09
3104120 3b20 2020 7661 7228 5479 7065 2920 202d 3e20 7465 726d 5f74 7970 655f 2854 7970 652c 2054 6572 6d29 0a09 3b20 2020 7368
3104200 6f75 6c64 5f62 6528 7379 6d62 6f6c 2c20 5479 7065 2c20 322c 2074 6572 6d5f 7479 7065 2854 6572 6d2c 5479 7065 2929 0a09
3104260 292e 0a0a 0a74 6572 6d5f 7479 7065 5f28 636f 6d70 6f75 6e64 2c20 5465 726d 2920 3a2d 2063 6f6d 706f 756e 6428 5465 726d
3104340 292e 0a74 6572 6d5f 7479 7065 5f28 6361 6c6c 6162 6c65 2c20 5465 726d 2920 3a2d 2063 616c 6c61 626c 6528 5465 726d 292e
3104420 0a74 6572 6d5f 7479 7065 5f28 636f 6e73 7461 6e74 2c20 5465 726d 2920 3a2d 2061 746f 6d69 6328 5465 726d 292e 0a74 6572
3104500 6d5f 7479 7065 5f28 6e75 6d62 6572 2c20 2020 5465 726d 2920 3a2d 206e 756d 6265 7228 5465 726d 292e 0a74 6572 6d5f 7479
3104560 7065 5f28 7379 6d62 6f6c 2c20 2020 5465 726d 2920 3a2d 2061 746f 6d28 5465 726d 292e 0a25 2020 2020 2020 2020 2028 7374
3104640 7269 6e67 2c20 2020 5465 726d 2920 3a2d 2073 7472 696e 6728 5465 726d 292e 0a74 6572 6d5f 7479 7065 5f28 696e 7465 6765
3104720 722c 2020 5465 726d 2920 3a2d 2069 6e74 6567 6572 2854 6572 6d29 2e0a 2520 2020 2020 2020 2020 2872 6174 696f 6e61 6c2c
3105000 2054 6572 6d29 203a 2d20 7261 7469 6f6e 616c 2854 6572 6d29 2e0a 7465 726d 5f74 7970 655f 2866 6c6f 6174 2c20 2020 2054
3105060 6572 6d29 203a 2d20 666c 6f61 7428 5465 726d 292e 0a25 2020 2020 2020 2020 2028 636f 6d70 6c65 782c 2020 5465 726d 2920
3105140 3a2d 2063 6f6d 706c 6578 2854 6572 6d29 2e0a 0a0a 0a25 2020 2063 6861 7273 282b 5465 726d 290a 2520 2020 6973 2074 7275
```

```
3105220 6520 7768 656e 2054 6572 6d20 6973 2061 2070 726f 7065 7220 6c69 7374 206f 6620 4953 4f20 3838 3539 2f31 206f 7220 4542
3105300 4344 4943 2063 6861 7261 6374 6572 2063 6f64 6573 2e0a 2520 2020 446f 206e 6f74 2063 6f6e 6675 7365 2069 7420 7769 7468
3105360 2069 735f 6368 6172 732f 3120 696e 206c 6962 7261 7279 2870 7269 6e74 5f63 6861 7273 292e 2020 416e 7920 7469 6d65 2077
3105440 650a 2520 2020 7361 7920 7468 6174 2073 6f6d 6574 6869 6e67 2069 7320 6f72 2073 686f 756c 6420 6265 2061 2022 6368 6172
3105520 7322 2c20 5f74 6963 735f 2069 7320 7768 6174 2077 6520 6d65 616e 2e0a 0a63 6861 7273 282a 2920 3a2d 2021 2c20 6661 696c
3105600 2e0a 6368 6172 7328 5b5d 292e 0a63 6861 7273 285b 4368 6172 7c43 6861 7273 5d29 203a 2d0a 0969 6e74 6567 6572 2843 6861
3105660 7229 2c0a 0943 6861 7220 3e3d 2030 2c20 4368 6172 203d 3c20 3235 352c 0a09 6368 6172 7328 4368 6172 7329 2e0a 0a0a 252d
3105740 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d
3106020 2d2d 2d2d 2d2d 2d2d 2d2d 2d2d 2d2d 2d2d 2d2d 2d2d 2d2d 2b0a 2520 2020 5468 6520 666f 6c6c 6f77 696e 6720 7072 6564 6963
3106100 6174 6573 2061 7265 2072 6574 6169 6e65 6420 666f 7220 6261 636b 7761 7264 7320 636f 6d70 6174 6962 696c 6974 792e 097c
3106160 0a25 2020 204e 6f20 6e65 7720 7072 6564 6963 6174 6573 206f 6620 7468 6973 2066 6f72 6d20 7368 6f75 6c64 2062 6520 7772
3106240 6974 7465 6e2c 2061 6e64 2074 6865 7365 206f 6e65 7309 7c0a 2520 2020 7769 6c6c 2062 6520 7265 6d6f 7665 6420 6672 6f6d
3106320 2074 6865 206c 6962 7261 7279 2062 7920 332e 3520 6174 2074 6865 206c 6174 6573 742e 0909 7c0a 252d 2d2d 2d2d 2d2d 2d2d
3106400 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d
3106460 2d2d 2d2d 2d2d 2d2d 2d2d 2d2d 2d2d 2b0a 0a6d 7573 745f 6265 5f61 746f 6d28 4172 672c 204e 2c20 476f 616c 2920 3a2d 0a09
3106540 6d75 7374 5f62 6528 6174 6f6d 2c20 4172 672c 204e 2c20 476f 616c 292e 0a0a 6d75 7374 5f62 655f 6265 7477 6565 6e28 4c2c
3106620 2055 2c20 4172 672c 204e 2c20 476f 616c 2920 3a2d 0a09 6d75 7374 5f62 6528 6265 7477 6565 6e28 4c2c 5529 2c20 4172 672c
3106700 204e 2c20 476f 616c 292e 0a0a 6d75 7374 5f62 655f 6361 6c6c 6162 6c65 2841 7267 2c20 4e2c 2047 6f61 6c29 203a 2d0a 096d
3106760 7573 745f 6265 2863 616c 6c61 626c 652c 2041 7267 2c20 4e2c 2047 6f61 6c29 2e0a 0a6d 7573 745f 6265 5f63 6861 7273 2841
3107040 7267 2c20 4e2c 2047 6f61 6c29 203a 2d0a 096d 7573 745f 6265 2863 6861 7273 2c20 4172 672c 204e 2c20 476f 616c 292e 0a0a
3107120 6d75 7374 5f62 655f 636f 6d70 6f75 6e64 2841 7267 2c20 4e2c 2047 6f61 6c29 203a 2d0a 096d 7573 745f 6265 2863 6f6d 706f
3107200 756e 642c 2041 7267 2c20 4e2c 2047 6f61 6c29 2e0a 0a6d 7573 745f 6265 5f63 6f6e 7374 616e 7428 4172 672c 204e 2c20 476f
3107260 616c 2920 3a2d 0a09 6d75 7374 5f62 6528 636f 6e73 7461 6e74 2c20 4172 672c 204e 2c20 476f 616c 292e 0a0a 6d75 7374 5f62
3107340 655f 6772 6f75 6e64 2841 7267 2c20 4e2c 2047 6f61 6c29 203a 2d0a 096d 7573 745f 6265 2867 726f 756e 642c 2041 7267 2c20
3107420 4e2c 2047 6f61 6c29 2e0a 0a6d 7573 745f 6265 5f69 6e74 6567 6572 2841 7267 2c20 4e2c 2047 6f61 6c29 203a 2d0a 096d 7573
3107500 745f 6265 2869 6e74 6567 6572 2c20 4172 672c 204e 2c20 476f 616c 292e 0a0a 6d75 7374 5f62 655f 6e6f 6e65 6567 2841 7267
3107560 2c20 4e2c 2047 6f61 6c29 203a 2d0a 096d 7573 745f 6265 286e 6f6e 6e65 672c 2041 7267 2c20 4e2c 2047 6f61 6c29 2e0a 0a6d
3107640 7573 745f 6265 5f6e 6f6e 7661 7228 4172 672c 204e 2c20 476f 616c 2920 3a2d 0a09 6d75 7374 5f62 6528 6e6f 6e76 6172 2c20
3107720 4172 672c 204e 2c20 476f 616c 292e 0a0a 6d75 7374 5f62 655f 6e75 6d62 6572 2841 7267 2c20 4e2c 2047 6f61 6c29 203a 2d0a
3110000 096d 7573 745f 6265 286e 756d 6265 722c 2041 7267 2c20 4e2c 2047 6f61 6c29 2e0a 0a6d 7573 745f 6265 5f6f 6e65 6f66 2841
3110060 7267 2c20 4c69 7374 2c20 4e2c 2047 6f61 6c29 203a 2d0a 096d 7573 745f 6265 286f 6e65 6f66 284c 6973 7429 2c20 4172 672c
3110140 204e 2c20 476f 616c 292e 0a0a 6d75 7374 5f62 655f 7072 6f70 6572 5f6c 6973 7428 4172 672c 204e 2c20 476f 616c 2920 3a2d
3110220 0a09 6d75 7374 5f62 6528 7072 6f70 6572 5f6c 6973 742c 2041 7267 2c20 4e2c 2047 6f61 6c29 2e0a 0a6d 7573 745f 6265 5f73
3110300 796d 626f 6c28 4172 672c 204e 2c20 476f 616c 2920 3a2d 0a09 6d75 7374 5f62 6528 7379 6d62 6f6c 2c20 4172 672c 204e 2c20
3110360 476f 616c 292e 0a0a 6d75 7374 5f62 655f 7661 7228 4172 672c 204e 2c20 476f 616c 2920 3a2d 0a09 6d75 7374 5f62 6528 7661
3110440 722c 2041 7267 2c20 4e2c 2047 6f61 6c29 2e0a 0a0a 0a25 2020 206d 7573 745f 6265 2854 7970 652c 2054 6572 6d2c 2041 7267
3110520 4e6f 2c20 476f 616c 290a 2520 2020 6368 6563 6b73 2077 6865 7468 6572 2074 6865 2054 6572 6d20 6265 6c6f 6e67 7320 746f
3110600 2074 6865 2069 6e64 6963 6174 6564 2054 7970 6520 2879 6f75 2077 696c 6c20 6f66 7465 6e0a 2520 2020 6361 6c6c 206d 7573
3110660 745f 6265 2f32 2077 6865 6e20 796f 7520 6b6e 6f77 2074 6861 7420 7468 6973 2074 6573 7420 7769 6c6c 2066 6169 6c2c 2062
3110740 7574 2079 6f75 2063 616e 0a25 2020 206c 6561 7665 2069 7420 746f 206d 7573 745f 6265 2f34 2074 6f20 6368 6563 6b20 666f
3111020 7220 796f 7529 2e20 2049 6620 6974 2069 736e 2774 2c20 7468 6572 6520 6172 6520 7477 6f0a 2520 2020 6361 7365 733a 2020
3111100 7468 6520 5465 726d 206d 6179 206e 6f74 2062 6520 696e 7374 616e 7469 6174 6564 2065 6e6f 7567 6820 746f 2074 656c 6c20
3111160 7965 742c 2069 6e20 7768 6963 690a 2520 2020 6361 7365 2061 6e20 494e 5354 414e 5449 4154 494f 4e20 4641 554c 5420 7769
3111240 6c6c 2062 6520 7265 706f 7274 6564 2c20 6f72 2074 6865 2054 6572 6d20 6d61 7920 6265 0a25 2020 2064 6566 696e 6974 656c
3111320 7920 6e6f 7420 6f66 2074 6865 2074 7970 652c 2069 6e20 7768 6963 6820 6361 7365 2061 2054 5950 4520 4552 524f 5220 6973
3111400 2072 6570 6f72 7465 642e 0a25 2020 2059 6f75 2073 686f 756c 6420 7573 6520 7468 6973 2069 6e20 636f 6d6d 616e 6473 2077
3111460 6974 6820 7369 6465 2065 6666 6563 7473 2c20 616e 6420 7368 6f75 6c64 2061 7272 616e 6765 0a25 2020 2074 6861 7420 6966
3111540 2074 6869 7320 7072 6564 6963 6174 6520 646f 6573 206e 6f74 2073 7563 6365 6564 2074 6865 2073 6964 6520 6566 6665 6374
3111620 2873 2920 7769 6c6c 206e 6f74 0a25 2020 2074 616b 6520 706c 6163 652e 0a0a 6d75 7374 5f62 6528 5479 7065 2c20 5465 726d
3111700 2c20 4172 674e 6f2c 2047 6f61 6c29 203a 2d0a 0974 7970 655f 6368 6563 6b28 5479 7065 2c20 5465 726d 2c20 4172 0000 6e3f
3111760 b328 f3e0 0013 f1e4 0000 0000 000b 6465 706f 7369 7420 7365 7400 15ad 000d 6465 706f 7369 7420 7465 7874 7300 000f 6465
3112040 706f 7369 7420 7465 7874 7320 3200 043b 000a 6e61 6d65 2065 7272 6f72 0014 1e0d 000c 7072 6f70 6572 2063 6861 7273 00a5
3112120 001e 2240 2823 2938 392f 3037 2f31 3720 7374 7269 6e67 732e 706c 0933 332e 3122 0014 1ee9 0200 710f 29c8 1f29 0014 8788
3112200 0014 4e34 0000 0028 0013 33c0 b27c b66c 0000 0e1b 7fff ffff 0015 82f4 0200 0db5 0100 32b5 0000 6e3f 0000 315f 0000 6e3f
3112260 b328 0453 0014 7120 0000 0000 2c78 0012 0002 438a 4e1c 0000 0000 6f7f 228c 7d62 2cac 2031 0002 438a 2ca0 32df 0000 0000
```

| | | | | | | | | | | | | | | | | | | | | | | | | |
|---|---|---|---|---|---|---|---|---|---|---|---|---|---|---|---|---|---|---|---|---|---|---|---|---|
| 3112340 | 0000 | 0001 | 0014 | 744c | 0014 | 7d4c | 0002 | 438a | 000b | 58d0 | 000e | 6765 | 6e73 | 796d | 5f63 | 6f75 | 6e74 | 6572 | 0000 | 32df | 0011 | ff90 | 0200 | 6f87 |
| 3112420 | 0000 | 6e3f | 0000 | 0008 | 000a | 18f0 | 0002 | 438a | 0003 | 0075 | 0000 | 0000 | 000b | 6461 | 7465 | 5f70 | 6c75 | 735f | 3300 | 0000 | 0000 | 714f | b328 | 7d04 |
| 3112500 | 0015 | 8788 | 0000 | 0000 | 000b | 6461 | 7465 | 5f70 | 6c75 | 735f | 3100 | 0000 | 2c78 | 000e | 0002 | 438a | 9294 | 9860 | 228c | 3077 | 000f | 98dc | 0300 | 6f77 |
| 3112560 | 0000 | 6e3f | 0000 | 000c | 0013 | fb9c | 0013 | fb9c | 0001 | 0075 | 0000 | 0000 | 000d | 636c | 6561 | 725f | 6465 | 7369 | 676e | 7300 | 000f | 89bc | 0300 | 6f3f |
| 3112640 | 0000 | 6e3f | 0000 | 000c | 0013 | b39c | 0013 | b39c | 0001 | 0075 | 0000 | 0000 | 0014 | 7df8 | 0500 | 6f77 | 0000 | 6e3f | 0000 | 0014 | 0014 | 7e68 | 0014 | 7e98 |
| 3112720 | 0001 | 0075 | 0000 | 0003 | 27f0 | 0016 | 0014 | 7e98 | 4dc0 | 0018 | ffff | fffb | 9294 | 936c | 2edc | 000b | 27f0 | 0018 | 0013 | fc08 | 4e1c | 0000 | 0000 | 0007 |
| 3113000 | 4960 | 4a48 | 0018 | 228c | 2954 | 7eba | 0002 | 438a | 2ca0 | 0493 | 0000 | 0000 | 0000 | 0001 | 0014 | 7e80 | 0013 | fc40 | 0011 | 6ed4 | 0011 | 2a90 | 0011 | be1c |
| 3113060 | 0200 | 6f57 | 0000 | 6e3f | 0000 | 0008 | 0014 | 7fa8 | 0014 | 7fa8 | 0001 | 0075 | 0000 | 0000 | 0011 | ffd4 | 0100 | 6f8f | 0000 | 6e3f | 0000 | 0004 | 0015 | 32bc |
| 3113140 | 0015 | 32bc | 0021 | 0000 | 0000 | 0000 | 0006 | 5167 | 4174 | 6f6d | 0013 | 6725 | 0000 | 7127 | b328 | 2589 | 0015 | 8730 | 0000 | 0000 | 0011 | fff4 | 0400 | 6f97 |
| 3113220 | 0000 | 6e3f | 0000 | 0010 | 0015 | 3448 | 0015 | 3448 | 0021 | 0000 | 0000 | 0000 | 0000 | 711f | b328 | 82ee | 0015 | 8704 | 0000 | 0000 | 0000 | 70cf | b328 | 7f52 |
| 3113300 | 0014 | 4c3c | 0000 | 0000 | 2c78 | 0028 | 0002 | 438a | 2520 | 46ec | 3310 | 247c | 0014 | 7ecc | 0014 | 3858 | 3d24 | 41d4 | 0000 | 0003 | 242c | 0000 | 0014 | 7e38 |
| 3113360 | 0006 | 5170 | 496e | 6974 | 0000 | 000b | 0006 | 5167 | 496e | 6974 | 0014 | 2831 | 0000 | 7117 | b328 | 7fa2 | 0015 | 875c | 0000 | 0000 | 2c78 | 0024 | 0002 | 438a |
| 3113440 | 45c4 | 46d8 | 24d0 | 0000 | 0014 | 7fdc | 0014 | 39f8 | 0014 | 7ffc | 0010 | 2340 | 0014 | 801c | 0012 | 0090 | 0000 | 6fa7 | 0000 | 6e3f | 0000 | 0000 | 0015 | 33c0 |
| 3113520 | 0015 | 33c0 | 0021 | 0000 | 0000 | 0000 | 0014 | 7ebc | 0100 | 6f57 | 0000 | 6e3f | 0000 | 0004 | 0014 | 804c | 0014 | 804c | 0001 | 0075 | 0000 | 0000 | 0012 | 00b0 |
| 3113600 | 0100 | 6faf | 0000 | 6e3f | 0000 | 0004 | 0015 | 3468 | 0015 | 3468 | 0021 | 0000 | 0000 | 0000 | 0009 | 4d55 | 5831 | 365f | 395f | 5300 | 27f0 | 0012 | 0013 | fec4 |
| 3113660 | 4e1c | 0000 | 0000 | 0007 | 228c | 29d1 | 2cac | 8052 | 0002 | 438a | 2ca0 | 8076 | 0000 | 0000 | 0000 | 0001 | 0014 | 8038 | 0013 | fec4 | 0013 | fece | 0011 | 2b6c |
| 3113740 | 0006 | 5170 | 4174 | 6f6d | 0014 | 807e | 0012 | 0010 | 0200 | 6fb7 | 0000 | 6e3f | 0000 | 0008 | 0015 | 33a4 | 0015 | 33a4 | 0021 | 0000 | 0000 | 0000 | 000f | c600 |
| 3114020 | 0200 | 6fbf | 0000 | 6e3f | 0000 | 0008 | 0015 | 3410 | 0015 | 3410 | 0021 | 0000 | 0000 | 0000 | 0012 | 0104 | 0200 | 6fc7 | 0000 | 6e3f | 0000 | 0008 | 0015 | 342c |
| 3114100 | 0015 | 342c | 0021 | 0000 | 0000 | 0000 | 000f | 8d98 | 0100 | 6f47 | 0000 | 6e3f | 0000 | 0004 | 0014 | 8b00 | 0014 | 8b00 | 0001 | 0075 | 0000 | 0000 | b464 | 3eac |
| 3114160 | 0014 | 19d8 | 0015 | 3dac | 000f | 9730 | 0300 | 6f67 | 0000 | 6e3f | 0000 | 000c | 0014 | 819c | 0014 | 819c | 0001 | 0075 | 0000 | 0000 | 0009 | 4d55 | 5831 | 365f |
| 3114240 | 365f | 5300 | b464 | 3f54 | 0014 | 1a74 | 0015 | 3dc4 | 2c78 | 0028 | 0002 | 438a | 2520 | 4754 | 33a0 | 247c | 0014 | 8118 | 0014 | 3858 | 3d24 | 41d4 | 0000 | 0003 |
| 3114320 | 242c | 0000 | 0014 | 7e38 | 000f | 52f8 | 0000 | 0010 | 0014 | 4ae0 | 0014 | 4930 | 27f0 | 0024 | 0014 | 0060 | 4e1c | 0000 | 0000 | 0007 | 2520 | 4740 | 3050 | 247c |
| 3114400 | 0014 | 7fdc | 0010 | 2340 | 0014 | 801c | 2cac | 7c01 | 0002 | 438a | 2ca0 | 2e61 | 0000 | 0000 | 0000 | 0001 | 0014 | 8178 | 0014 | 0060 | 0014 | 006a | 000b | 5c58 |
| 3114460 | 0011 | 5bfc | 0100 | 6f5f | 0000 | 6e3f | 0000 | 0004 | 0014 | 0104 | 0014 | 0104 | 0001 | 0075 | 0000 | 0000 | 0014 | 8108 | 0200 | 6f67 | 0000 | 6e3f | 0000 | 0008 |
| 3114540 | 0014 | 8220 | 0014 | 8220 | 0001 | 0075 | 0000 | 0000 | b464 | 3e10 | 0014 | 1c48 | 0015 | 3e0c | 27f0 | 0012 | 0014 | 8244 | 4e1c | 0000 | 0000 | 0007 | 228c | 0013 |
| 3114620 | 2cac | 7b01 | 0002 | 438a | 2ca0 | 2fed | 0000 | 0000 | 0000 | 0001 | 0014 | 820c | 0014 | 8244 | 0014 | 824e | 000b | 5b70 | 2954 | 0028 | 0002 | 438a | 56f8 | 6854 |
| 3114700 | 69b0 | 46ec | 3ba0 | 0000 | 0014 | 81d0 | 0018 | 3a4c | 0014 | 81d0 | 0014 | 2330 | 0014 | 81f0 | 0000 | 75bf | b328 | 0000 | 0015 | 6888 | 0000 | 0000 | 000d | 7772 |
| 3114760 | 6974 | 655f | 6465 | 7369 | 676e | 7300 | 0000 | 0000 | 0015 | 404d | 0000 | 0000 | 0015 | 85e8 | 0007 | 5173 | 7562 | 6368 | 6b00 | 7951 | 0007 | 5173 | 7562 | 7374 |
| 3115040 | 7200 | 3109 | 0012 | 0124 | 0500 | 6fcf | 0000 | 6e3f | 0000 | 0014 | 000b | 33c4 | 000b | 33c4 | 0021 | 0000 | 0000 | 0000 | 000f | bcf0 | 0500 | 6fd7 | 0000 | 6e3f |
| 3115120 | 0000 | 0014 | 0015 | 3294 | 0015 | 3294 | 0021 | 0000 | 0000 | 0000 | 0012 | 72d8 | 0300 | 6f2f | 0000 | 6e3f | 0000 | 000c | 0014 | 0834 | 0014 | 0834 | 0001 | 0075 |
| 3115200 | 0000 | 0000 | 000b | 2564 | 2d25 | 334d | 2125 | 3032 | 7900 | 0000 | 27f0 | 0014 | 0014 | 8338 | 9294 | 9860 | 3050 | 22bc | 0014 | 5b5c | 2954 | 0028 | 0002 | 438a |
| 3115260 | 3244 | 3664 | 5e54 | 0000 | 0200 | 6f07 | 6b48 | 6b88 | 4254 | 0000 | 0000 | 000b | 239c | 0000 | 0008 | cebc | 0007 | 5173 | 7472 | 6368 | 7200 | 836e | 0000 | 75f7 |
| 3115340 | b328 | 8392 | 0015 | 6798 | 0000 | 0000 | 0015 | 3010 | 0003 | cbf4 | 0005 | 5150 | 5f4c | 3500 | 0014 | 59e4 | 0300 | 6fdf | 0000 | 6e3f | 0000 | 000c | 0015 | 3274 |
| 3115420 | 0015 | 3274 | 0021 | 0000 | 0000 | 0000 | 0000 | 0000 | 0013 | e834 | 0000 | 0000 | 0014 | 45e0 | 0007 | 5163 | 6861 | 746f | 6d00 | 357d | 0007 | 5161 | 746f | 6d63 |
| 3115500 | 6800 | 0573 | 0000 | 75a7 | b328 | a708 | 0015 | 6550 | 0000 | 0000 | 0012 | 01cc | 0200 | 6fe7 | 0000 | 6e3f | 0000 | 0008 | 0015 | 32f4 | 0015 | 32f4 | 0021 | 0000 |
| 3115560 | 0000 | 0000 | 0012 | 01ac | 0200 | 6fef | 0000 | 6e3f | 0000 | 0008 | 0015 | 32d8 | 0015 | 32d8 | 0021 | 0000 | 0000 | 0000 | 2c78 | 0010 | 0002 | 438a | 239c | 0000 |
| 3115640 | 0015 | fd14 | 2c78 | 0020 | 0002 | 438a | 370c | 001c | 3260 | 0018 | 3244 | 35c8 | 35b0 | 001c | 239c | 0000 | 0014 | 5c34 | 000c | 7772 | 6974 | 655f | 6465 | 7369 |
| 3115720 | 676e | 0000 | 2c78 | 0020 | 0002 | 438a | 370c | 001c | 3260 | 0018 | 3244 | 35c8 | 35b0 | 001c | 239c | 0000 | 0014 | 5c34 | 000d | 6465 | 7369 | 676e | 5f65 | 7069 |
| 3116000 | 6c6f | 6700 | 2c78 | 0014 | 0002 | 438a | 3260 | 0018 | 239c | 0000 | 0014 | 5c34 | b464 | 3dd4 | 0014 | 1adc | 0015 | 3dd0 | 000c | 67d4 | 0400 | 6f37 | 0000 | 6e3f |
| 3116060 | 0000 | 0010 | 0013 | dd38 | 0013 | dd38 | 0001 | 0075 | 0000 | 0000 | 0014 | 82f4 | 0400 | 6f2f | 0000 | 6e3f | 0000 | 0010 | 0013 | dcc4 | 0013 | dcc4 | 0001 | 0075 |
| 3116140 | 0000 | 0000 | 0000 | 758f | b328 | 543d | 0015 | 6524 | 0000 | 0000 | 2c78 | 0014 | 0002 | 438a | 3260 | 0018 | 239c | 0000 | 0014 | 5bd4 | 0006 | 5170 | 5061 | 7274 |
| 3116220 | 0014 | 8526 | 0006 | 4c43 | 4131 | 304b | 0015 | 3ea8 | 0012 | 4960 | 0400 | 6ff7 | 0000 | 6e3f | 0000 | 0010 | 0015 | 34cc | 0015 | 34cc | 0021 | 0000 | 0000 | 0000 |
| 3116300 | 0000 | 759f | b328 | 0000 | 0015 | 64b8 | 0000 | 0000 | 2c78 | 0018 | 0002 | 438a | 3260 | 001c | 3260 | 0018 | 3244 | 22bc | 0014 | 579c | 0007 | 434f | 4d50 | 5f31 |
| 3116360 | 3600 | 0000 | 2c78 | 0018 | 0002 | 438a | 3260 | 001c | 3260 | 0018 | 239c | 0000 | 0014 | 579c | 0007 | 202d | 7061 | 7468 | 2000 | 3ecc | 2c78 | 0014 | 0002 | 438a |
| 3116440 | 3260 | 001c | 239c | 0000 | 0014 | 579c | 0007 | 5169 | 6e73 | 7374 | 7200 | 3b15 | 2aa8 | 3f90 | 000d | 4990 | 0016 | 200c | 0014 | 84d4 | 0200 | 6f2f | 0000 | 6e3f |
| 3116520 | 0000 | 0008 | 0014 | 8738 | 0014 | 8744 | 0001 | 0075 | 0000 | 0000 | 000f | cc18 | 0500 | 6fff | 0000 | 6e3f | 0000 | 0014 | 0015 | 34ec | 0015 | 34ec | 0021 | 0000 |
| 3116600 | 0000 | 0000 | 0007 | 516f | 7574 | 7374 | 7200 | 3c1d | 000d | 2320 | 0400 | 7007 | 0000 | 6e3f | 0000 | 0010 | 0014 | 865c | 0014 | 869c | 0001 | 0075 | 0000 | 0000 |
| 3116660 | 0007 | 516f | 7574 | 6368 | 6b00 | 3ca1 | 0000 | 75b7 | b328 | 3cf9 | 0015 | 65b8 | 0000 | 0000 | 27f0 | 0020 | 0014 | 869c | 92d0 | 9410 | 3050 | 4290 | 0000 | 0018 |
| 3116740 | 0000 | 0003 | 239c | 0000 | 0014 | 868c | 0012 | 028c | 0500 | 700f | 0000 | 6e3f | 0000 | 0014 | 0015 | 3310 | 0015 | 3310 | 0021 | 0000 | 0000 | 0000 | 2954 | 0018 |
| 3117020 | 0002 | 438a | 4224 | 0018 | 0000 | 0003 | 239c | 0000 | 0014 | 86c4 | 0014 | 8620 | 0500 | 7007 | 0000 | 6e3f | 0000 | 0014 | 0015 | 3334 | 0015 | 3334 | 0021 | 0000 |
| 3117100 | 0000 | 0000 | 0006 | 5169 | 6e64 | 6578 | 0014 | 86e2 | 27f0 | 000c | 0015 | 48d0 | 54a8 | 2edc | 0012 | 7984 | 0400 | 7017 | 0000 | 6e3f | 0000 | 0010 | 0015 | 335c |
| 3117160 | 0015 | 335c | 0021 | 0000 | 0000 | 0000 | 0000 | 70af | b328 | 8732 | 0015 | 82f8 | 0000 | 0000 | 0015 | 31a8 | 000e | 7248 | 0015 | 3188 | 000d | 2038 | b464 | 3fa8 |
| 3117240 | 0015 | 68b4 | 0000 | 0000 | 27f0 | 000c | 0014 | 8744 | 48f8 | 228c | 2954 | 0020 | 0002 | 438a | a858 | aab4 | 0000 | a484 | a858 | aaf0 | ffff | ac08 | 239c | 0000 |
| 3117320 | 0014 | 85e4 | 0000 | 400f | b464 | 878a | 0014 | 3a18 | 0016 | b05c | 2c78 | 0014 | 0002 | 438a | 3260 | 0018 | 3244 | 22bc | 0014 | 58dc | 2aa8 | 3f24 | 0015 | 3f20 |
| 3117400 | 0014 | 4ed8 | 2c78 | 0014 | 0002 | 438a | 3260 | 0018 | 239c | 0000 | 0014 | 58dc | 0005 | 5173 | 7061 | 6e00 | b464 | 3f18 | 0014 | 4c70 | 0015 | 3f5c | 000f | 90b8 |

| | | | | | | | | | | | | | | | | | | | | | | | | |
|---|---|---|---|---|---|---|---|---|---|---|---|---|---|---|---|---|---|---|---|---|---|---|---|---|
| 3117460 | 0200 | 6f4f | 0000 | 6e3f | 0000 | 0008 | 0014 | 88b8 | 0013 | e248 | 0001 | 0075 | 0000 | 0000 | 0012 | 0364 | 0500 | 701f | 0000 | 6e3f | 0000 | 0014 | 0015 | 337c |
| 3117540 | 0015 | 337c | 0021 | 0000 | 0000 | 0000 | 0000 | 70ff | b328 | a3d9 | 0014 | 39e4 | 0000 | 0000 | 0005 | 7275 | 6e69 | 7400 | 0004 | 2e44 | 444c | 0000 | 2c78 | 0018 |
| 3117620 | 0002 | 438a | 3724 | 0018 | 3244 | 3228 | 239c | 0000 | 0014 | 5954 | 0008 | 2f62 | 696e | 2f72 | 6d20 | 0000 | 2c78 | 0018 | 0002 | 438a | 373c | 0018 | 36b8 | 3228 |
| 3117700 | 239c | 0000 | 0014 | 5954 | 0006 | 5144 | 346d | 6174 | 0000 | 0000 | 0000 | 70f7 | b464 | 886e | 0014 | 397c | 0014 | 39ac | 2c78 | 001c | 0002 | 438a | 3640 | 4550 |
| 3117760 | 4b8c | 0000 | 0000 | 0103 | 5370 | 22bc | 0014 | 59b4 | 0006 | 5144 | 7768 | 656e | 0014 | 889c | b464 | bc24 | 0014 | 15b0 | 0015 | bc20 | 0000 | 70ef | b464 | 0013 |
| 3120040 | 0014 | 3914 | 0015 | 3fc8 | 27f0 | 45bd | 0013 | e248 | 2ca0 | 88c6 | 0000 | 0000 | 0000 | 0001 | 0013 | e214 | 0013 | e248 | 0002 | 438a | 000b | 572c | 0005 | 5170 |
| 3120120 | 4f6e | 6500 | 0012 | 0384 | 0100 | 7027 | 0000 | 6e3f | 0000 | 0004 | 0015 | 33f8 | 0015 | 33f8 | 0021 | 0000 | 0000 | 0000 | 0000 | 70e7 | b464 | a079 | 0014 | 3810 |
| 3120200 | 0015 | 3ff8 | 2c78 | 0018 | 0002 | 438a | 35c8 | 41d4 | 0000 | 09f7 | 239c | 0000 | 0014 | 56d4 | 2aa8 | 3ef4 | 0016 | 213c | 0016 | 1f5c | 0000 | 70df | b464 | 4749 |
| 3120260 | 0014 | 3774 | 0015 | 4010 | 27f0 | 0018 | 0014 | 8960 | 92a8 | 9410 | 3050 | 92a8 | 97ac | 9294 | 97ac | 228c | 2954 | 0010 | 0002 | 438a | 239c | 0000 | 0014 | 56d4 |
| 3120340 | 0007 | 5163 | 6d70 | 7374 | 7200 | 899a | 0000 | 70d7 | b328 | 0673 | 0014 | 3740 | 0000 | 0000 | 0012 | 7964 | 0900 | 702f | 0000 | 6e3f | 0000 | 0024 | 0013 | c3dc |
| 3120420 | 0013 | c3dc | 0021 | 0000 | 0000 | 0000 | b464 | 3fc0 | 0014 | 39b0 | 0000 | 0000 | 0000 | 70af | b464 | 480d | 000a | fdd4 | 0015 | 4028 | 0014 | 5c44 | 0500 | 7037 |
| 3120500 | 0000 | 6e3f | 0000 | 0014 | 0015 | 34a4 | 0015 | 34a4 | 0021 | 0000 | 0000 | 0000 | 0011 | be3c | 0400 | 6f6f | 0000 | 6e3f | 0000 | 0010 | 0013 | b254 | 0013 | b254 |
| 3120560 | 0001 | 0075 | 0000 | 0000 | 0000 | 70af | b328 | 0013 | 0014 | 35e0 | 0000 | 0000 | 2c78 | 0010 | 0002 | 438a | 239c | 0000 | 0015 | 6094 | 2c78 | 0010 | 0002 | 438a |
| 3120640 | 239c | 0000 | 0015 | 60b4 | 001d | 2120 | 7e77 | 2065 | 7870 | 6563 | 7465 | 642c | 2062 | 7574 | 2066 | 6f75 | 6e64 | 207e | 717e | 6e00 | 000a | 7469 | 6d65 | 5f73 |
| 3120720 | 7461 | 6d70 | 0014 | 8ba8 | 0006 | 5167 | 466f | 7572 | 0014 | 4ae5 | 0000 | 70cf | b328 | 8a7e | 0014 | 351c | 0000 | 0000 | 0012 | 04f8 | 0600 | 7067 | 0000 | 6e3f |
| 3121000 | 0000 | 0018 | 0013 | c410 | 0013 | c410 | 0021 | 0000 | 0000 | 0000 | 0012 | 0598 | 0300 | 706f | 0000 | 6e3f | 0000 | 000c | 0015 | 3484 | 0015 | 3484 | 0021 | 0000 |
| 3121060 | 0000 | 0000 | 0006 | 517c | 466f | 7572 | 0013 | b8d5 | 000c | 706f | 7274 | 7261 | 795f | 6461 | 7465 | 0000 | 0008 | bc2c | 0400 | 7077 | 0000 | 6e3f | 0000 | 0010 |
| 3121140 | 0015 | 33d8 | 0015 | 33d8 | 0021 | 0000 | 0000 | 0000 | 2cac | 8b06 | 0002 | 438a | 2ca0 | 8b2a | 0000 | 0000 | 0000 | 0001 | 0013 | b4b4 | 0014 | 8b5c | 0014 | 8b50 |
| 3121220 | 000b | 5594 | 28c4 | 0020 | 0014 | 8b5c | 56f8 | 671c | 682c | 3050 | 2430 | 0000 | 0014 | 88f4 | 0010 | 2340 | 0014 | 90ec | 2b24 | 000b | 0002 | 438a | 0014 | 8b2e |
| 3121300 | 29c8 | 4e95 | 0014 | 8b44 | 0013 | b4be | 2954 | 0012 | 0002 | 438a | 4e1c | 0000 | 0000 | 0007 | 228c | 3077 | 0009 | 7374 | 7269 | 6e67 | 732e | 6f00 | 0007 | 5173 |
| 3121360 | 7472 | 6c65 | 6e00 | 8b8a | 000e | 85dc | 0200 | 22df | 0000 | 6e3f | 0000 | 0008 | 000a | 18f0 | 000a | 18f0 | 0000 | 0000 | 0000 | 0000 | 000d | 6461 | 7465 | 5f61 |
| 3121440 | 6e64 | 5f74 | 696d | 6500 | 000e | 8678 | 0000 | 0024 | 2ca0 | 0613 | 0000 | 0000 | 0000 | 0001 | 0013 | b518 | 0013 | b518 | 0002 | 438a | 000b | 4cb4 | 000e | 86dc |
| 3121520 | 0200 | 22d7 | 0000 | 6e3f | 0000 | 0008 | 000a | 18f0 | 000a | 18f0 | 0000 | 0000 | 0000 | 0000 | 000a | 7374 | 7269 | 6e67 | 732e | 706c | 0000 | 0000 | 0014 | 8bbc |
| 3121600 | 0000 | 0024 | 2ca0 | 32df | 0000 | 007c | 0000 | 0019 | 0013 | b634 | 0013 | bf40 | 0002 | 438a | 0013 | bc9c | 0000 | 6e5f | b328 | 837d | 0013 | c028 | 0000 | 0000 |
| 3121660 | 0000 | 0000 | 0000 | 0018 | 4e1c | 0000 | 0000 | 6fa7 | 52c4 | 0000 | 0000 | 6fa7 | 0014 | 8bdc | 0300 | 22d7 | 0000 | 6e3f | 0000 | 000c | 000a | 18f0 | 000a | 18f0 |
| 3121740 | 0000 | 0000 | 0000 | 0000 | b464 | 3534 | 0013 | c05c | 0014 | 87b0 | 2c78 | 0012 | 0002 | 438a | 4e1c | 0000 | 0000 | 7107 | 228c | 0000 | 0000 | 002c | 000b | 36dc |
| 3122020 | b27c | b66c | 0000 | 0e5c | 7fff | ffff | 0014 | 8ccc | 0200 | 0db5 | 0200 | 22ed | 0000 | 7087 | 00a4 | 8003 | 0000 | 315f | 0000 | 002c | 0014 | 8ca0 | b27c | b66c |
| 3122100 | 0000 | 0e5d | 7fff | ffff | 0014 | 8cf8 | 0200 | 0db5 | 0200 | 22ed | 0000 | 6fdf | 00a4 | 80c3 | 0000 | 315f | 0000 | 002c | 0014 | 8ccc | b27c | b66c | 0000 | 0e5e |
| 3122160 | 7fff | ffff | 0014 | 8d24 | 0200 | 0db5 | 0200 | 22ed | 0000 | 6fcf | 00a4 | e323 | 0000 | 315f | 0000 | 002c | 0014 | 8cf8 | b27c | b66c | 0000 | 0e5f | 7fff | ffff |
| 3122240 | 0014 | 8d50 | 0200 | 0db5 | 0200 | 22ed | 0000 | 6fd7 | 00a4 | e723 | 0000 | 315f | 0000 | 002c | 0014 | 8d24 | b27c | b66c | 0000 | 0e60 | 7fff | ffff | 0014 | 8d7c |
| 3122320 | 0200 | 0db5 | 0200 | 22ed | 0000 | 6f8f | 00a5 | 2503 | 0000 | 315f | 0000 | 002c | 0014 | 8d50 | b27c | b66c | 0000 | 0e61 | 7fff | ffff | 0014 | 8da8 | 0200 | 0db5 |
| 3122400 | 0200 | 22ed | 0000 | 702f | 00a4 | 8cc3 | 0000 | 315f | 0000 | 002c | 0014 | 8d7c | b27c | b66c | 0000 | 0e62 | 7fff | ffff | 0014 | 8dd4 | 0200 | 0db5 | 0200 | 22ed |
| 3122460 | 0000 | 6fef | 00a4 | 8283 | 0000 | 315f | 0000 | 002c | 0014 | 8da8 | b27c | b66c | 0000 | 0e63 | 7fff | ffff | 0014 | 8e00 | 0200 | 0db5 | 0200 | 22ed | 0000 | 6fe7 |
| 3122540 | 00a4 | 83e3 | 0000 | 315f | 0000 | 002c | 0014 | 8dd4 | b27c | b66c | 0000 | 0e64 | 7fff | ffff | 0014 | 8e2c | 0200 | 0db5 | 0200 | 22ed | 0000 | 700f | 00a4 | ec63 |
| 3122620 | 0000 | 315f | 0000 | 002c | 0014 | 8e00 | b27c | b66c | 0000 | 0e65 | 7fff | ffff | 0014 | 8e58 | 0200 | 0db5 | 0200 | 22ed | 0000 | 7007 | 00a4 | f263 | 0000 | 315f |
| 3122700 | 0000 | 002c | 0014 | 8e2c | b27c | b66c | 0000 | 0e66 | 7fff | ffff | 0014 | 8e84 | 0200 | 0db5 | 0200 | 22ed | 0000 | 7017 | 00a4 | 8783 | 0000 | 315f | 0000 | 002c |
| 3122760 | 0014 | 8e58 | b27c | b66c | 0000 | 0e67 | 7fff | ffff | 000b | 32f0 | 0200 | 0db5 | 0200 | 22ed | 0000 | 701f | 00a5 | 0223 | 0000 | 315f | 0015 | 40ac | 0000 | 0158 |
| 3123040 | 0014 | 59bd | 0014 | 8ed6 | 0600 | 32df | 0000 | 075b | 0000 | 3077 | 0000 | 0013 | 0013 | c905 | 0014 | 59a9 | 0014 | 5a71 | 0014 | 5a01 | 0014 | 8ede | 0014 | 5a41 |
| 3123120 | 0014 | 8f02 | 0600 | 32df | 0000 | 0763 | 0000 | 3077 | 0000 | 000b | 0013 | c875 | 0014 | 5a2d | 0014 | 5af5 | 0014 | 5a85 | 0014 | 8f0a | 0014 | 5ac5 | 0014 | 8f2e |
| 3123200 | 0600 | 32df | 0000 | 076b | 0000 | 3077 | 0000 | 0013 | 0013 | c7e5 | 0014 | 5ab1 | 0014 | 5b79 | 0014 | 5b09 | 0014 | 8f36 | 0014 | 5b49 | 0014 | 8f5a | 0600 | 32df |
| 3123260 | 0000 | 0773 | 0000 | 3077 | 0000 | 000b | 0013 | c755 | 0014 | 5b35 | 0014 | 5bfd | 0014 | 5b8d | 0014 | 8f62 | 0014 | 5bcd | 0014 | 8f86 | 0600 | 32df | 0000 | 077b |
| 3123340 | 0000 | 3077 | 0000 | 0013 | 0013 | c6c5 | 0014 | 5bb9 | 0014 | 5c81 | 0014 | 5c11 | 0014 | 8f8e | 0014 | 5c51 | 0014 | 8fb2 | 0600 | 32df | 0000 | 0783 | 0000 | 3077 |
| 3123420 | 0000 | 000b | 0013 | c635 | 0014 | 5c3d | 0014 | 5d05 | 0014 | 5c95 | 0014 | 8fba | 0014 | 5cd5 | 0014 | 8fde | 0600 | 32df | 0000 | 078b | 0000 | 3077 | 0000 | 0013 |
| 3123500 | 0013 | c5a5 | 0014 | 5cc1 | 0014 | 5d89 | 0014 | 5d19 | 0014 | 8fe6 | 0014 | 5d59 | 0014 | 900a | 0600 | 32df | 0000 | 0793 | 0000 | 3077 | 0000 | 000b | 0013 | c515 |
| 3123560 | 9de3 | bfa0 | 7ffb | 57f5 | 9010 | 0018 | d052 | 3ffe | 81c7 | e008 | 91e8 | 0008 | 9de3 | bfa0 | 7ffb | 57ef | 9010 | 0019 | b210 | 0008 | d056 | 7ffe | 80a6 | 0008 |
| 3123640 | 1480 | 0005 | 0100 | 0000 | b0a6 | 2001 | 3c80 | 0003 | f20e | 4018 | b210 | 3fff | 81c7 | e008 | 91e8 | 0019 | 9de3 | bfa0 | 7ffb | 57e1 | 9010 | 0018 | b010 | 0008 |
| 3123720 | d056 | 3ffe | 80a2 | 2001 | 3280 | 0003 | b010 | 3fff | f00e | 0000 | 81c7 | e008 | 81e8 | 0000 | 9de3 | bf98 | 1100 | 0549 | d002 | 217c | 8090 | 0008 | 3280 | 0014 |
| 3124000 | 1b00 | 0549 | 1500 | 0549 | 9412 | a17c | b810 | 2400 | ba10 | 2100 | baa7 | 6001 | b807 | 000a | c02f | bfff | b607 | bffe | 0c80 | 0009 | b827 | 2004 | 9010 | 001b |
| 3124060 | 7ffb | 57cb | fa2f | bffe | d027 | 0000 | baa7 | 6001 | 1cbf | fffb | b827 | 2004 | 1b00 | 0549 | 9a13 | 617c | b12e | 2002 | f006 | 000d | 81c7 | e008 | 81e8 | 0000 |
| 3124140 | 9de3 | bfa0 | 7ffb | 57b9 | 9010 | 0018 | aa10 | 0008 | 7ffb | 57b6 | 9010 | 0019 | ac10 | 0008 | d055 | bffe | ee55 | 7ffe | b606 | a001 | 8090 | 001b | ae25 | c008 |
| 3124220 | 0680 | 001b | ae25 | c01a | aea5 | e001 | 2c80 | 0019 | b410 | 3fff | f255 | bffe | b410 | 0016 | b2a6 | 6001 | 0c80 | 0011 | b005 | 401b | f80e | 0000 | fa0e | 8000 |
| 3124300 | b006 | 2001 | 80a7 | 001d | 0280 | 0008 | b406 | a001 | aea5 | e001 | 0c80 | 000a | b606 | e001 | f255 | bffe | b005 | 401b | b410 | 0016 | b2a6 | 6001 | 3cbf | fff4 |
| 3124360 | f80e | 0000 | 1980 | 0003 | b410 | 001b | b410 | 3fff | 81c7 | e008 | 91e8 | 001a | 9de3 | bfa0 | f627 | a050 | fa27 | a058 | 7ffb | 578d | 9010 | 0018 | b010 | 0008 |
| 3124440 | 7ffb | 578a | 9010 | 001c | ee56 | 3ffe | b810 | 0008 | ec57 | 3ffe | 8090 | 001a | 3680 | 0004 | fa07 | a05c | b425 | c019 | fa07 | a05c | f607 | a058 | 8090 | 001d |
| 3124520 | 3680 | 0004 | 8090 | 0019 | ba25 | 801b | 8090 | 0019 | 0680 | 000e | 8090 | 001a | 0680 | 000c | 9e06 | 8019 | 80a3 | c017 | 1480 | 0009 | 8090 | 001b | 0680 | 0007 |

```
3124600  8090 001d 0680 0005 a007 401b 80a4 0016 2480 0004 80a6 801d 1080 004c 9010 203f b006 0019 1480 0007 b807 001b b210 001a
3124660  ae27 4019 fa07 a060 1080 0007 b610 2000 ea07 a050 b210 001d b626 8019 ba10 0015 ae10 2000 b2a6 6001 2c80 000f 8090 001b
3124740  d00f 0000 d60e 0000 b807 2001 9622 c008 8090 000b 02bf fff8 b006 2001 8090 000b 3680 0003 b010 203e b010 203c 1080 002f
3125020  9010 0018 2480 0017 80a5 e002 8090 001d 3680 0004 b410 001d 1080 0028 9010 203e b810 001b b8a7 2001 2c80 0024 9010 203d
3125100  e20e 0000 b006 2001 a224 401a 8090 0011 22bf fffa b8a7 2001 8090 0011 3680 0003 b010 203e b010 203c 1080 0018 9010 0018
3125160  2480 0016 9010 203d 8090 001d 3680 0004 b410 001d 1080 0011 9010 203c b010 0017 b0a6 2001 2c60 000d 9010 203d d20f 0000
3125240  b807 2001 9226 8009 8090 0009 22bf fffa b0a6 2001 8090 0009 3680 0003 b010 203e b010 203c 9010 0018 7fff ff49 0100 0000
3125320  81c7 e008 91e8 0008 1100 054a 9012 2240 1300 054a d022 617c 1500 054a 81c3 e008 c022 a180 9de3 bfa0 7ffb 5714 9010 0018
3125400  ba10 0008 f857 7ffe 1500 054a f002 a17c 1100 054a d602 2180 9602 c01c 80a2 e200 0480 0004 d622 2180 1080 000f b010 3fff
3125460  b8a7 2001 2c80 0009 2100 054a de0f 4000 b8a7 2001 de2e 0000 ba07 6001 1cbf fffc b006 2001 2100 054a f024 217c 2300 054a
3125540  f004 6180 81c7 e008 81e8 0000 9de3 bfa0 7ffb 56f6 9010 0018 ba10 0008 d057 7ffe 1500 054a f002 a17c 8090 0019 0680 0007
3125620  8090 001a 0680 0005 9606 401a 80a2 c008 2480 0004 1100 054a 1080 0017 b010 3fff d802 2180 b810 001a 9803 001a 80a3 2200
3125700  0480 0004 d822 2180 1080 000f b010 3fff b8a7 2001 0c80 0008 ba07 4019 e20f 4000 b8a7 2001 e22e 0000 ba07 6001 1cbf fffc
3125760  b006 2001 2500 054a f024 a17c 2700 054a f004 e180 81c7 e008 81e8 0000 9de3 bfa0 1100 054a fa02 217c 1300 054a 9212 6190
3126040  9010 001d 4000 19d1 9410 0018 d20f 4000 8090 0009 2280 0008 1500 054a ba07 6001 d20f 4000 8090 0009 32bf fffe ba07 6001
3126120  1500 054a 9412 a240 9427 400a 80a2 a200 1900 054a 0480 0004 d423 2180 1080 0006 ba10 3fff 1b00 054a fa23 617c 1f00 054a
3126200  fa03 e180 81c7 e008 91e8 001d 9de3 bf98 f027 a044 f227 a048 9507 bffc 9807 bff8 9410 2005 9010 0018 4000 04ce 9210 0019
3126260  b810 0008 ba07 2005 ba27 6001 d20f 4000 b610 2005 80a2 6030 3280 000d d807 bff8 80a6 e001 2480 000a d807 bff8 c02f 4000
3126340  ba27 6001 d20f 4000 b626 e001 80a2 6030 22bf fff9 80a6 e001 d807 bff8 1700 054a fa02 e17c 8090 000c 2280 0006 de07 bffc
3126420  9a10 202d da2f 4000 ba07 6001 de07 bffc 80a3 c01b 2680 0009 e607 bffc e207 bffc a006 e005 a204 6002 80a4 4010 3480 000d
3126500  ee07 bffc e607 bffc 8090 0013 3480 0041 d207 bffc ea07 bffc a810 2002 a825 0015 80a5 2005 2480 003b d207 bffc ee07 bffc
3126560  9210 202e ae25 e001 ee27 bffc f00f 0000 b807 2001 f02f 4000 ba07 6001 d22f 4000 ba07 6001 f60f 0000 b807 2001 f62f 4000
3126640  8090 001b 12bf fffc ba07 6001 9610 2065 d62f 7fff d807 bffc 8090 000c 2480 0006 a010 202d 9a10 202b b807 6001 1080 0007
3126720  da2f 4000 e02f 4000 e407 bffc b807 6001 a420 0012 e427 bffc e807 bffc 80a5 2064 0680 0008 d007 bffc 7ffe a264 9210 2064
3127000  9002 2030 d02f 0000 b807 2001 d007 bffc 7ffe a25e 9210 200a 4000 038a 9210 200a 9002 2030 d02f 0000 d007 bffc 4000 0385
3127060  9210 200a b807 2001 9002 2030 d02f 0000 ba07 2001 c02f 4000 1080 0063 ba07 6001 8090 0009 3480 001f e207 bffc 9410 2030
3127140  d42f 4000 ba07 6001 9810 202e d82f 4000 f607 bffc de07 bffc 8090 001b 9e03 e001 ba07 6001 1680 000b de27 bffc a010 2030
3127220  e02f 4000 f607 bffc de07 bffc 8090 001b 9e03 e001 ba07 6001 06bf fff9 de27 bffc f60f 0000 b807 2001 f62f 4000 8090 001b
3127300  0280 0045 ba07 6001 10bf fffb f60f 0000 90a4 401b 2680 0026 d407 bffc f40f 0000 b807 2001 f42f 4000 8090 001a 12bf fffc
3127360  ba07 6001 e607 bffc b827 6001 a624 c01b e627 bffc e807 bffc a825 2001 e827 bffc ea07 bffc 8090 0015 2680 000d ae10 202e
3127440  ac10 2030 ec2f 0000 e807 bffc b807 2001 a825 2001 e827 bffc ea07 bffc 8090 0015 36bf fff9 ac10 2030 ae10 202e ee2f 0000
3127520  b210 2030 ba07 2001 f22f 4000 ba07 6001 c02f 4000 1080 001c ba07 6001 9422 a001 d427 bffc d607 bffc 8090 000b 2680 000e
3127600  9a10 202e da0f 0000 b807 2001 d82f 4000 d407 bffc ba07 6001 9422 a001 d427 bffc d607 bffc 8090 000b 36bf fff8 d80f 0000
3127660  9a10 202e da2f 4000 ba07 6001 f60f 0000 b807 2001 f62f 4000 8090 001b 12bf fffc ba07 6001 2300 054a a214 6240 b827 6001
3127740  a227 0011 80a4 6200 2700 054a 0480 0004 e224 e180 1090 0006 b810 3fff 2900 054a f825 217c 2b00 054a f805 6180 81c7 e008
3130020  91e8 001c 0300 054a d800 617c 0300 054a c400 6180 8400 a004 80a0 a200 0480 0004 c420 6180 1080 0011 9a10 3fff d02b 0000
3130100  9803 2001 920a 60ff d22b 0000 9803 2001 940a a0ff d42b 0000 9803 2001 960a e0ff d62b 0000 9803 2001 0700 054a d820 e17c
3130160  0900 054a da01 2180 81c3 e008 9000 000d 1500 054a d202 a180 9202 6001 80a2 6200 0480 0004 d222 a180 1080 000a 9a10 3fff
3130240  1300 054a d602 617c 0300 054a d02a c000 1802 617c 9803 2001 d822 617c da00 6180 81c3 e008 9000 000d 1100 054a d002 2180
3130320  80a2 2200 2480 0004 1300 054a 1080 0003 9a10 3fff da02 6180 81c3 e008 9000 000d 9de3 bfa0 1100 054a 9012 2240 8090 0018
3130400  ba06 4008 0680 000a b806 0008 8090 0019 0680 0007 1900 054a d803 2180 b006 0019 80a6 000c 2480 0004 f00f 4000 1080 0008
3130460  ba10 3fff c02f 4000 7ffb 5589 9010 001c d025 8000 f02f 4000 ba10 2000 81c7 e008 91e8 001d 9de3 bfa0 c026 8000 1700 054a
3130540  c102 e188 c126 c000 1100 054a 9012 2240 ae05 0008 8090 0018 b810 2000 ac06 4008 0680 0069 ba10 0017 8090 0019 2680 0067
3130620  ba10 3fff 1b00 054a da03 6180 b006 0019 90a6 000d 3480 0061 ba10 3fff f00d 8000 c02d 8000 e20d c000 80a4 602b 2280 0007
3130700  ba05 e001 e60d c000 80a4 e021 3280 0004 120f 4000 ba05 e001 d20f 4000 9222 6030 80a2 600a 3a80 0013 e20f 4000 ba07 6001
3130760  d80f 4000 9823 2030 80a3 200a 2abf fffd ba07 6001 de0f 4000 8090 000f 3280 0008 b810 2001 4000 033f 9010 0017 d026 8000
3131040  ba10 2000 1080 0041 f02d 8000 e20f 4000 80a4 602e 3280 003c f02d 8000 ba07 6001 ea0f 4000 aa25 6030 80a5 600a 3a80 000a
3131120  8090 001c ba07 6001 ea0f 4000 b807 2001 aa25 6030 80a5 600a 2abf fffc ba07 6001 8090 001c 2280 002c f02d 8000 d40f 4000
3131200  9412 a020 80a2 a065 3280 0014 fa0f 4000 ba07 6001 d80f 4000 80a3 202b 2280 0007 ba07 6001 de0f 4000 80a3 e02d 3280 0004
3131260  e40f 4000 ba07 6001 e40f 4000 a424 a030 80a4 a00a 3a80 0018 f02d 8000 ea0f 4000 aa25 6030 80a5 600a 3a80 0009 fa0f 4000
3131340  ba07 6001 ea0f 4000 aa25 6030 80a5 600a 2abf fffd ba07 6001 fa0f 4000 8090 001d 3280 0009 f02d 8000 4000 02fa 9010 0017
3131420  83a0 18c0 ba10 2001 c326 c000 1080 0003 f02d 8000 ba10 3fff 81c7 e008 91e8 001d 0300 054a 8210 6240 8090 0008 0680 0008
3131500  9a02 0001 0500 054a c400 a180 9002 2004 80a2 0002 2480 0004 c60b 4000 1080 000d 9010 3fff c622 4000 9a03 6001 c80b 4000
3131560  c822 8000 9a03 6001 ca0b 4000 ca22 c000 9a03 6001 da0b 4000 da23 0000 9010 2000 81c3 e008 0100 0000 8090 0008 0680 0006
3131640  1500 054a d402 a180 80a2 000a 2680 0004 1700 054a 1080 0006 9010 3fff 9612 e240 d00a 000b d022 4000 9010 2000 81c3 e008
```

```
3131720 0100 0000 9de3 bfa0 7ffb 54dc 9010 0018 ba10 0008 7ffb 54d9 9010 001b b610 0008 f056 fffe 8090 0019 0680 0009 80a6 8018
3132000 1280 0007 0100 0000 d657 7ffe 9406 4018 80a2 800b 2480 0004 ba07 4019 1080 000c b010 3ffe b0a6 2001 2c80 0009 b010 2000
3132060 f4cf 4000 f20e c000 ba07 6001 80a6 8019 02bf fff9 b606 e001 b010 3fff 81c7 e008 81e8 0000 9de3 bfa0 7ffb 54bc 9010 0018
3132140 ba10 0008 1100 054a ae02 2240 8090 0019 b810 001a 0680 000a b010 0017 8090 001a 0680 0007 0100 0000 d457 7ffe 9206 401a
3132220 80a2 400a 2480 0007 b8a7 2001 7fff fcd4 9010 2000 b010 3ffe 1080 0013 d026 c000 1900 054a ba07 4019 0c80 0008 f423 2180
3132300 de0f 4000 b8a7 2001 de2e 0000 ba07 6001 1cbf fffc b006 2001 2100 054a f024 217c c02e 0000 7ffb 549e 9010 0017 d026 c000
3132360 b010 2000 91c7 e008 81e8 0000 9de3 bfa0 7ffb 5492 9010 0018 ba10 0008 7ffb 548f 9010 001b b010 0008 ee56 3ffe 809c 0019
3132440 0600 000d ae25 c019 8090 001a 0680 000a 9090 0017 0680 0008 0100 0000 d656 3ffe de57 7ffe 9e23 c00b 80a3 c01a 2280 0005
3132520 b2a6 6001 1080 0018 b010 3ffe b2a6 6001 2c80 000a b210 0017 f60f 4000 f80e 0000 ba07 6001 80a6 c01c 02bf fff9 b006 2001
3132600 1080 000d b010 3fff ba07 401a b2a6 6001 2c80 0009 b010 2000 f80f 4000 f60e 0000 ba07 6001 80a7 001b 02bf fff9 b006 2001
3132660 b010 3fff 81c7 e008 81e8 0000 9de3 bfa0 7ffb 5462 9010 0018 ba10 0008 1100 054a ae02 2240 8090 0019 9206 8019 0680 0009
3132740 b010 c017 8090 001a 0680 0006 0100 0000 d457 7ffe 80a2 400a 2480 0007 da57 7ffe 7fff fc7b 9010 2000 b010 3ffe 1080 0022
3133020 d026 c000 b826 6001 8090 001c 9a23 401a 2100 054a 0680 0008 da24 2180 e20f 4000 b8a7 2001 e22e 0000 ba07 6001 1cbf fffc
3133100 b006 2001 2700 054a e604 c180 ba07 401a b824 c019 b8a7 2001 2c80 0009 2d00 054a ea0f 4000 b8a7 2001 ea2e 0000 ba07 6001
3133160 1cbf fffc b006 2001 2d00 054a f025 a17c c02e 0000 7ffb 5436 9010 0017 d026 c000 b010 2000 81c7 e008 81e8 0000 9de3 bfa0
3133240 7ffb 542a 9010 0018 ba10 0008 7ffb 5427 9010 001a b410 0008 d256 bffe d857 7ffe 1100 054a ae02 2240 9803 0009 1f00 054a
3133320 8090 0019 b810 0019 b010 0017 0680 000a 1823 e180 e057 7ffe 80a6 4010 1480 0006 2500 054a e404 a180 80a4 a200 2480 0007
3133400 b8a7 2001 7fff fc3a 9010 2000 b010 3ffe 1080 0027 d026 c000 2c80 0009 f856 bffe e60f 4000 b8a7 2001 e62e 0000 ba07 6001
3133460 1cbf fffc b006 2001 f856 bffe b8a7 2001 2c80 0009 1100 054a ec0e 8000 b8a7 2001 ec2e 0000 b406 a001 1cbf fffc b006 2001
3133540 1100 054a d002 2180 b422 0019 b4a6 a001 2c80 0009 1700 054a d40f 4000 b4a6 a001 d42e 0000 ba07 6001 1cbf fffc b006 2001
3133620 1700 054a f022 e17c c02e 0000 7ffb 53f0 9010 0017 d026 c000 b010 2000 81c7 e008 81e8 0000 9de3 bfa0 ae10 0019 808d e008
3133700 f627 a050 f427 a04c f227 a048 1280 0023 f027 a044 1500 054a d002 a184 9002 2001 80a2 20ff 0480 000e d022 a184 ba10 2100
3133760 baa7 6001 1700 054b 0c80 0006 b802 e05c baa7 6001 c02f 0000 1cbf fffe b807 2001 1b00 054a 9810 2001 d823 6184 2100 054a
3134040 fa04 2180 2300 054b baa7 6001 1f00 054a b604 605c 0c80 0009 b803 e240 e40f 0000 2900 054a e305 2184 baa7 6001 b807 2001
3134120 1cbf fffb e82c 801b 7ffb 53bc d007 a044 f207 a04c f007 a050 ae0d e007 80a5 e007 b810 0008 fa57 3ffe af2d e002 1880 00df
3134200 b410 c01d 1300 0528 9212 6128 d005 c009 81c2 c000 0100 0000 0014 a148 0014 a148 0014 a154 0014 a1dc 0014 a264 0014 a2e4
3134260 0014 a364 0014 a3e8 c026 4000 1080 00cf c026 0000 8090 001d 1500 054b b807 001d b602 a05c 0480 000d b827 2001 d80f 0000
3134340 2100 054a d80b 001b e004 2184 80a3 c010 2280 0007 8090 001d ba27 6001 8090 001d 14bf fff7 b827 2001 8090 001d a426 801d
3134420 0480 000d e426 0000 e80f 0000 1100 054a e80d 001b d002 2184 80a5 0008 1280 0006 0100 0000 ba27 6001 8090 001d 14bf fff7
3134500 b827 2001 1080 00ad fa26 4000 8090 001d 1900 054b b807 001d b603 205c 0480 000d b827 2001 de0f 0000 2500 054a de0b c01b
3134560 e404 a184 80a3 c012 3280 0007 8090 001d ba27 6001 8090 001d 14bf fff7 b827 2001 8090 001d a826 801d 0480 000d e826 0000
3134640 ec0f 0000 1500 054a ec0d 801b d402 a184 80a5 800a 0280 0006 0100 0000 ba27 6001 8090 001d 14bf fff7 b827 2001 1080 008b
3134720 fa26 4000 8090 001d 1900 054b 0480 000d b603 205c de0f 0000 2500 054a de0b c01b e404 a184 80a3 c012 2280 0007 8090 001d
3135000 ba27 6001 8090 001d 14bf fff7 b807 2001 8090 001d a826 801d 0480 000d e826 4000 ec0f 0000 1500 054a ec0d 801b d402 a184
3135060 80a5 800a 1280 0006 0100 0000 ba27 6001 8090 001d 14bf fff7 b807 2001 1080 006b fa26 0000 8090 001d 1900 054b 0480 000d
3135140 b603 205c de0f 0000 2500 054a de0b c01b e404 a184 80a3 c012 3280 0007 8090 001d ba27 6001 8090 001d 14bf fff7 b807 2001
3135220 8090 001d a826 801d 0480 000d e826 4000 ec0f 0000 1500 054a ec0d 801b d402 a184 80a5 800a 0280 0006 0100 0000 ba27 6001
3135300 8090 001d 14bf fff7 b807 2001 1080 004b fa26 0000 8090 001d 1900 054b 0480 000d b603 205c de0f 0000 2500 054a de0b c01b
3135360 e404 a184 80a3 c012 2280 0007 8090 001d ba27 6001 8090 001d 14bf fff7 b807 2001 8090 001d a826 801d b807 001d 0480 000e
3135440 e826 4000 b827 2001 d00f 0000 1700 054a 100a 001b d602 e184 80a2 000b 2280 0007 da06 4000 ba27 6001 8090 001d 34bf fff7
3135520 b827 2001 da06 4000 9a26 800d 9a23 401d 1080 0026 da26 0000 8090 001d 2300 054b 0480 000d b604 605c e60f 0000 2d00 054a
3135600 e60c c01b ec05 a184 80a4 c016 3280 0007 8090 001d ba27 6001 8090 001d 14bf fff7 b807 2001 8090 001d 9226 801d b807 001d
3135660 0480 000e 9226 4000 b827 2001 d80f 0000 2100 054a d80b 001b e004 2184 80a3 0010 3280 0007 e406 4000 ba27 6001 8090 001d
3135740 34bf fff7 b827 2001 e406 4000 a426 8012 a424 801d e426 0000 f206 4000 f006 0000 b426 8019 b026 8018 81c7 e008 81e8 0000
3136020 9de3 bfa0 1100 054a d002 217c c02a 0000 1100 054a 4000 014f 9012 2240 81c7 e008 91e8 0008 0000 0000 1080 000b 8210 2000
3136100 9092 4008 1680 0008 8210 0008 9090 0009 1680 0004 8090 0008 1680 0003 9220 0009 9020 0008 9a92 4000 1280 0004 9610 0008
3136160 1080 009c 0100 0000 80a2 c00d 0a80 0094 9410 2000 0532 0000 80a2 c002 0a80 0027 9810 2000 80a3 4002 1a80 000d 8610 2001
3136240 9b2b 6004 10bf fffc 9803 2001 9a83 400d 1a80 0007 8600 e001 8528 a004 9b33 6001 9a03 4002 1080 0007 8620 e001 80a3 400b
3136320 0abf fff7 0100 0000 0280 0002 0100 0000 86a0 e001 0680 0075 0100 0000 9622 c00d 9410 2001 3080 0009 952a a001 0680 0005
3136400 9b33 6001 9622 c00d 1080 0004 9402 a001 9602 c00d 9422 a001 86a0 e001 16bf fff7 8090 000b 3080 0065 9b2b 6004 80a3 400b
3136460 08bf fffe 9883 2001 0280 0065 9823 2001 8090 000b 952a a004 0680 002f 9b33 6001 96a2 c00d 0680 0017 9b33 6001 96a2 c00d
3136540 0680 000b 9b33 6001 96a2 c001 0680 0005 9b33 6001 96a2 c00d 1080 0050 9402 a00f 9682 c00d 1080 004d 9402 a00d 9682 c00d
3136620 0680 0005 9b33 6001 96a2 c00d 1080 0047 9402 a00b 9682 c00d 1080 0044 9402 a009 9682 c00d 0680 000b 9b33 6001 96a2 c00d
3136700 0680 0005 9b33 6001 96a2 c00d 1080 003b 9402 a007 9682 c00d 1080 0038 9402 a005 9682 c00d 0680 0005 9b33 6001 96a2 c00d
3136760 1080 0032 9402 a003 9682 c00d 1080 002f 9402 a001 9682 c00d 0680 0017 9b33 6001 96a2 c00d 0680 000b 9b33 6001 96a2 c00d
```

```
3137040 0680 0005 9b33 6001 96a2 c00d 1080 0023 9402 bfff 9682 c00d 1080 0020 9402 bffd 9682 c00d 0680 0005 9b33 6001 96a2 c00d
3137120 1080 001a 9402 bffb 9682 c00d 1080 0017 9402 bff9 9682 c00d 0680 000b 9b33 6001 96a2 c00d 0680 0005 9b33 6001 96a2 c00d
3137200 1080 000e 9402 bff7 9682 c00d 1080 000b 9402 bff5 9682 c00d 0680 0005 9b33 6001 96a2 c00d 1080 0005 9402 bff3 9682 c00d
3137260 1080 0002 9402 bff1 98a3 2001 16bf ffa2 8090 000b 2680 0002 9602 c009 8090 0001 2680 0002 9620 000b 81c3 e008 9010 000b
3137340 91d0 2002 81c3 e008 9010 2000 0000 0000 9de3 bf98 9010 0018 4000 0068 9210 2000 c13f bff8 c11f bff8 81c7 e008 81e8 0000
3137420 da4a 0000 0300 0292 9600 6131 c44b 400b 8088 a004 1230 0016 9410 2000 c84b 400b 8089 2008 2280 0008 80a3 602b 9002 2001
3137500 10bf fffb da4a 0000 9002 2001 1080 0006 da4a 0000 02bf fffd 80a3 602d 22bf fffb 9410 2001 ca4b 400b 8089 6004 3280 0005
3137560 9810 2030 1080 0019 9010 2000 9810 2030 9823 000d 9002 2001 da4a 0000 d24b 400b 808a 6004 2280 000e 8090 000a 8810 2030
3137640 8821 000d 9002 2001 da4a 0000 d24b 400b 992b 2001 872b 2002 9803 0003 808a 6004 12bf fff7 9803 0004 8090 000a 2280 0003
3137720 9020 000c 9010 000c 81c3 e008 0100 0000 9de3 bfa0 f027 a044 f227 a048 1100 054b d002 2160 8090 0008 3280 0008 d207 a048
3140000 9210 2400 7ffb 327d 9010 2001 1300 054b d022 6160 d207 a048 d007 a044 1b00 054b da03 6160 9810 001c 9610 001b 4000 04bb
3140060 9410 001a 81c7 e008 91e8 0008 9de3 bfa0 f027 a044 f227 a048 1100 054b d002 2160 8090 0008 3280 0008 d207 a048 9210 2400
3140140 7ffb 3266 9010 2001 1300 054b d022 6160 d207 a048 d007 a044 1b00 054b da03 6160 9810 001c 9610 001b 4000 04f1 9410 001a
3140220 81c7 e008 91e8 0008 9de3 bd58 131f ffff 9212 63ff f027 a044 9007 a044 9607 bdec 9807 bde8 9a07 bde4 4000 006e 9410 2000
3140300 8090 0019 2280 0005 d207 bde8 d007 a044 d026 4000 d207 bde8 8090 0009 3280 0006 1700 03d2 1500 054a c11a a198 1080 0019
3140360 c13f bdd8 d602 e370 9407 bdec d627 bdcc 9607 bdbc 9207 bdcc 4000 0929 9007 bdc0 d807 bdbc 808b 2008 2280 0006 e007 bdbc
3140440 1f00 0295 9a10 2022 da23 e1c8 e007 bdbc 808c 2004 2280 0006 c51f bdc0 2500 0295 a210 2022 e224 a1c8 c51f bdc0 c53f bdd8
3140520 c11f bdd8 81c7 e008 81e8 0000 0000 0000 9de3 bf80 f027 a044 4000 14be 0100 0000 d027 bffc d007 bffc 8090 0008 1280 000f
3140600 0100 0000 1100 054a 9012 21a0 1300 054a 9212 61a8 1500 054a 9412 a1ab d607 a044 9810 2000 4000 1485 0100 0000 9010 207f
3140660 4000 14b8 0100 0000 9010 2002 9210 2001 7ffb 13d3 0100 0000 d027 bff8 9010 2003 9210 2001 7ffb 13ce 0100 0000 d027 bff4
3140740 9007 bfec 4000 1483 0100 0000 d027 bff0 d207 bff0 d407 bffc 80a2 400a 0280 0006 0100 0000 d607 bff0 80a2 ffff 12bf fff5
3141020 0100 0000 9010 2002 d207 bff8 7ffb 13bc 0100 0000 9010 2003 d207 bff4 7ffb 13b8 0100 0000 d807 bff0 80a3 3fff 1280 0006
3141100 0100 0000 da07 bff0 da27 bfe4 1080 0004 0100 0000 de07 bfec de27 bfe4 e007 bfe4 e027 bfe8 d007 bfe8 81c7 e008 91e8 0008
3141160 9de3 bfb0 f027 a044 fa27 a058 f006 0000 9e10 2002 f027 bffc fa4e 0000 c027 0000 da07 a058 1100 0292 c023 4000 de26 c000
3141240 c026 e004 c026 e008 c026 e20c a802 2131 d24f 4014 a610 2000 808a 6008 aa10 2000 ac10 2000 ae10 2001 0280 000c a026 2001
3141320 80a5 c019 3680 0005 ba10 2000 b006 2001 fa4e 0000 ae05 e001 d24f 4014 808a 6008 32bf fff9 80a5 c019 80a6 a002 2680 000d
3141400 80a7 602b 80a5 c019 9a10 2001 a026 2001 0680 0007 da27 0000 8090 001d 3280 0005 80a7 602b 1080 00e5 c026 c000 80a7 602b
3141460 3280 0009 80a7 602d 80a5 c019 3680 0011 ba10 2000 b006 2001 fa4e 0000 1080 000d ae05 e001 3280 000c 9027 6020 80a5 c019
3141540 9410 2001 1680 0006 d426 e004 b006 2001 fa4e 0000 1080 0003 ae05 e001 ba10 2000 9027 6020 80a2 204e 9a10 3fff 1500 052b
3141620 1880 00ca da27 bff8 9332 2005 932a 6001 992a 6002 9202 400c 992b 2001 9202 400c 9202 4008 9a10 201f 920a 400d 932a 6003
3141700 9412 a074 d602 400a 80a2 c008 3280 00bc 80a6 a002 9202 400a d002 6004 81c2 0000 0100 0000 0000 0000 0014 ad74 ffff ffff
3141760 0014 b110 0000 004e 0014 af6c 0000 0029 0014 ae40 ffff ffff 0014 b110 ffff ffff 0014 b110 ffff ffff 0014 b110 ffff ffff
3142040 0014 b110 0000 002e 0014 af6c ffff ffff 0014 b110 ffff ffff 0014 b110 ffff ffff 0014 b110 ffff ffff 0014 b110 ffff ffff
3142120 0014 b110 0000 000e 0014 ae1c ffff ffff 0014 b110 0000 0010 0014 ad80 0000 0011 0014 ade0 0000 0012 0014 ade0 0000 0013
3142200 0014 ade0 0000 0014 0014 ade0 0000 0015 0014 ade0 0000 0016 0014 ade0 0000 0017 0014 ade0 0000 0018 0014 ade0 0000 0019
3142260 0014 ade0 ffff ffff 0014 b110 ffff ffff 0014 b110 ffff ffff 0014 b110 0000 0049 0014 ae40 ffff ffff 0014 b110 ffff ffff
3142340 0014 b110 80a6 a002 2680 0075 80a6 a002 80a7 6030 9e10 2002 a010 0018 0280 0007 de27 0000 80a6 a002 0680 0010 80a7 6020
3142420 1280 000e 0100 0000 80a5 c019 3680 0005 ba10 2000 b006 2001 fa4e 0000 ae05 e001 80a7 6030 22bf fffa 80a5 c019 80a6 a002
3142500 36bf fff4 80a7 6020 1080 00d0 c027 bff8 9410 2002 d427 0009 9610 2001 d627 bff8 80a5 c019 a010 0018 ac10 2001 1680 0006
3142560 fa2e e00c b006 2001 fa4e 0003 1080 00c3 ae05 e001 1080 00c1 ba10 2000 80a5 c019 1680 0006 0100 0000 b006 2001 fa4e 0000
3142640 1080 018c ae05 e001 1080 018a ba10 2000 80a5 c019 3680 0005 ba10 2000 b006 2001 fa4e 0000 ae05 e001 80a7 6061 1700 054a
3142720 aa10 2001 0680 0017 a802 e1b0 80a7 607a 3480 0015 a610 001d 1080 0013 a627 6020 3480 0016 80a7 6061 80a5 c019 3680 0005
3143000 ba10 2000 b006 2001 fa4e 0000 ae05 e001 80a7 6061 0680 0007 aa05 6001 80a7 607a 3480 0005 a610 001d 1080 0003 a627 6020
3143060 a610 001d da4d 4014 80a4 c00d 22bf ffed 80a5 6008 80a7 6061 2680 0006 a610 001d 80a7 607a 3480 0003 a610 001d a627 6020
3143140 e84d 4014 80a4 c014 3280 0003 a610 0015 a605 6001 80a4 e003 0680 0010 aa05 6001 80a4 e008 3680 0007 9a10 200b 9410 200a
3143220 a025 6003 d427 0000 1080 0005 a026 0010 a025 6008 a026 0010 da27 0000 9e10 2003 de26 c000 e627 bff8 80a6 a002 2680 0300
3143300 d007 bff8 9626 2001 80a4 000b 3280 02ec 90a7 6020 1080 02e9 a010 2000 80a5 c019 3680 0005 ba10 2000 b006 2001 fa4e 0000
3143360 ae05 e001 80a7 6061 1500 054a a610 2001 0680 0014 a802 a1bc 80a7 607a 3480 0012 aa10 001d 1080 0010 aa27 6020 3680 0005
3143440 ba10 2000 b006 2001 fa4e 0000 ae05 e001 80a7 6061 0680 0007 a604 e001 80a7 607a 3480 0005 aa10 001d 1080 0003 aa27 6020
3143520 aa10 001d d84c c014 80a5 400c 22bf fff0 80a5 c019 80a4 e003 3280 000a 80a4 e004 9210 200c d227 0000 9610 2004 d626 c000
3143600 9810 2001 d827 bff8 a026 2001 80a4 e004 32bf ffcb 80a6 a002 9e10 200c de27 0000 9010 2004 d026 c000 8090 001d 9210 2001
3143660 a026 2002 aa06 e00c 0280 0014 d227 bff8 80a7 6029 2280 0012 8090 001d 80a5 a200 3680 000f 8090 001d 80a5 c019 fa2d 4016
3143740 1680 0006 ac05 a101 b006 2001 fa4e 0000 1080 0003 ae05 e001 ba10 2000 8090 001d 32bf fff1 80a7 6029 8090 001d 0280 0010
3144020 80a7 6029 2280 000e 80a7 6029 80a5 c019 9a10 2001 1680 0006 da26 e20c b006 2001 fa4e 0000 1080 0003 ae05 e001 ba10 2000
3144100 8090 001d 12bf fff4 80a7 6029 3260 000b 9610 200d 80a5 c019 1680 0006 a010 0018 b006 2001 fa4e 0000 1080 0003 ae05 e001
```

| | | | | | | | | | | | | | | | | | | | | | | | | |
|---|---|---|---|---|---|---|---|---|---|---|---|---|---|---|---|---|---|---|---|---|---|---|---|---|
| 3144160 | ba10 | 2000 | 9610 | 200d | 10bf | ff90 | d627 | 0000 | 10bf | ff8f | 80a6 | a002 | 1080 | 007f | a406 | e00c | 80a6 | a002 | 2680 | 0075 | d807 | bff8 | 80a6 | a002 |
| 3144240 | 3280 | 000c | 80a7 | 6030 | 80a5 | c019 | 1680 | 0006 | 0100 | 0000 | b006 | 2001 | fa4e | 0000 | 1080 | 0072 | ae05 | e001 | 1080 | 0070 | ba10 | 2000 | 80a7 | 6030 |
| 3144320 | 9410 | 2002 | 0280 | 0005 | d427 | 0009 | 80a7 | 6020 | 1280 | c01a | c100 | 0000 | 80a7 | 6020 | 3280 | 000b | 80a5 | c019 | 80a6 | a002 | 3680 | 0004 | 80a6 | a002 |
| 3144400 | 1080 | 0059 | a026 | 2001 | 3280 | 0004 | 80a5 | c019 | aa25 | 6001 | 80a5 | c019 | 1680 | 0006 | aa05 | 6001 | b006 | 2001 | fa4e | 0000 | 1080 | 0003 | ae05 | e001 |
| 3144460 | ba10 | 2000 | 80a7 | 6030 | 02bf | ffed | 80a7 | 6020 | 22bf | ffeb | 80a7 | 6020 | 1080 | 004f | a026 | 2001 | a810 | 2000 | 9010 | 2002 | d027 | 0000 | 80a5 | 0015 |
| 3144540 | 9210 | 2001 | a010 | 0018 | a210 | 0016 | 1680 | 000c | d227 | bff8 | 80a5 | a200 | 3680 | 0006 | a805 | 2001 | 9410 | 2030 | d42c | 8016 | ac05 | a001 | a805 | 2001 |
| 3144620 | 80a5 | 0015 | 26bf | fff9 | 80a5 | a200 | 80a5 | a200 | 3680 | 0005 | 9610 | 2001 | fa2c | 8016 | 1080 | 0003 | ac05 | a001 | d626 | e20c | d006 | e008 | aa05 | 6001 |
| 3144700 | a225 | 8011 | aa25 | 4011 | 9002 | 0015 | 80a5 | c019 | aa10 | 2000 | 1680 | 0006 | d026 | e008 | b006 | 2001 | fa4e | 0000 | 1080 | 0028 | ae05 | e001 | 1080 | 0026 |
| 3144760 | ba10 | 2000 | 80a5 | c019 | 1680 | 0006 | 0100 | 0000 | b006 | 2001 | fa4e | 0000 | 1080 | 0072 | ae05 | e001 | 1080 | 0070 | ba10 | 2000 | de07 | a058 | 80a6 | a003 |
| 3145040 | 1680 | 0006 | f023 | c000 | d007 | bff8 | 80a2 | 3fff | 22bf | ff23 | 80a6 | a002 | d207 | bff8 | 8090 | 0009 | 2480 | 017e | 80a7 | 602b | d406 | e008 | 9402 | 8015 |
| 3145120 | 1080 | 0179 | d426 | e008 | 8090 | 001a | 32bf | fff0 | de07 | a058 | d807 | bff8 | 8090 | 000c | 24bf | ff14 | 80a6 | a002 | da06 | e008 | 9a03 | 4015 | 10bf | ff0f |
| 3145200 | da26 | e008 | 9027 | 6020 | 80a2 | 2045 | 18bf | fff6 | 1500 | 052c | 9332 | 2005 | 932a | 6001 | 9202 | 4008 | 9810 | 201f | 920a | 400c | 932a | 6003 | 9412 | a360 |
| 3145260 | d602 | 400a | 80a2 | c008 | 32bf | ffec | d807 | bff8 | 9202 | 400a | d002 | 6004 | 81c2 | 0000 | 0100 | 0000 | 0000 | 0000 | 0014 | b120 | ffff | ffff | 0014 | b2f4 |
| 3145340 | ffff | ffff | 0014 | b2f4 | ffff | ffff | 0014 | b2f4 | ffff | ffff | 0014 | b2f4 | ffff | ffff | 0014 | b2f4 | 0000 | 0024 | 0014 | b2e8 | 0000 | 0025 | 0014 | b2a8 |
| 3145420 | 0000 | 0044 | 0014 | b2e8 | 0000 | 0045 | 0014 | b2a8 | ffff | ffff | 0014 | b2f4 | 0000 | 000b | 0014 | b2e8 | ffff | ffff | 0014 | b2f4 | 0000 | 000d | 0014 | b2e8 |
| 3145500 | 0000 | 000c | 0014 | b2e4 | ffff | ffff | 0014 | b2f4 | 0000 | 0010 | 0014 | b15c | 0000 | 0011 | 0014 | b1e0 | 0000 | 0012 | 0014 | b1e0 | 0000 | 0013 | 0014 | b1e0 |
| 3145560 | 0000 | 0014 | 0014 | b1e0 | 0000 | 0015 | 0014 | b1e0 | 0000 | 0016 | 0014 | b1e0 | 0000 | 0017 | 0014 | b1e0 | 0000 | 0018 | 0014 | b1e0 | 0000 | 0019 | 0014 | b1e0 |
| 3145640 | ffff | ffff | 0014 | b2f4 | ffff | ffff | 0014 | b2f4 | ffff | ffff | 0014 | b2f4 | ffff | ffff | 0014 | b2f4 | ffff | ffff | 0014 | b2f4 | ffff | ffff | 0014 | b2f4 |
| 3145720 | da07 | bff8 | 8090 | 000d | 0680 | 0008 | 0100 | 0000 | a026 | 2001 | d04c | 0000 | 80a2 | 202e | 0280 | 0003 | 0100 | 0000 | a004 | 2001 | 1080 | 0007 | a206 | e00c |
| 3146000 | 9610 | 2004 | 1080 | 00b9 | d627 | 0000 | 1080 | 00b7 | d827 | 0000 | d007 | 0000 | 8090 | 0008 | 02bf | fff9 | 80a2 | 2001 | 02bf | fff7 | 80a2 | 2002 | 22bf | fff8 |
| 3146060 | 9810 | 2003 | 1080 | 00ae | 9027 | 6020 | 80a6 | a002 | 2680 | 00a3 | d807 | bff8 | 80a6 | a002 | 3280 | 000f | d007 | 0000 | 80a5 | c019 | 1680 | 0006 | 0100 | 0000 |
| 3146140 | b006 | 2001 | fa4e | 0000 | 1080 | 00a0 | ae05 | e001 | 1080 | 009e | ba10 | 2000 | 1080 | 0004 | d007 | 0000 | 1080 | 0005 | d027 | 0000 | 80a2 | 2003 | 22bf | fffd |
| 3146220 | 9010 | 2005 | d207 | bff8 | 80a2 | 7fff | 3280 | 0004 | 80a5 | c019 | c027 | bff8 | 80a5 | c019 | 1680 | 0010 | a604 | e001 | b006 | 2001 | fa4e | 0000 | 1080 | 000d |
| 3146300 | ae05 | e001 | 3280 | 0004 | 80a5 | c019 | a624 | e001 | 80a5 | c019 | 1680 | 0006 | a604 | e001 | b006 | 2001 | fa4e | 0000 | 1080 | 0003 | ae05 | e001 | ba10 | 2000 |
| 3146360 | 80a7 | 6030 | 0280 | 0005 | 80a7 | 6020 | 1280 | 000a | 0100 | 0000 | 80a7 | 6020 | 32bf | fff3 | 80a5 | c019 | 80a6 | a002 | 36bf | ffec | 80a6 | a002 | 1080 | 006b |
| 3146440 | a026 | 2001 | 10bf | ffbc | a026 | 2001 | 1080 | 0014 | d007 | 0000 | 1080 | 0012 | d007 | 0000 | 1080 | 0010 | d007 | 0000 | 1080 | 000e | d007 | 0000 | 1080 | 000c |
| 3146520 | d007 | 0000 | 1080 | 000a | d007 | 0000 | 1080 | 0008 | d007 | 0000 | 1080 | 0006 | d007 | 0000 | 1080 | 0004 | d007 | 0000 | 1080 | 0005 | d227 | 0000 | 80a2 | 2003 |
| 3146600 | 22bf | fffd | 9210 | 2005 | d407 | bff8 | a010 | 0018 | 80a2 | a001 | 3680 | 000a | a405 | 4013 | 9610 | 2001 | d627 | bff8 | fa2c | 4016 | a604 | e001 | a620 | 0013 |
| 3146660 | ac05 | a001 | 1080 | 0028 | e626 | e008 | a810 | 2000 | 80a5 | 0012 | 1680 | 000b | ec27 | bff4 | 80a5 | a200 | 3680 | 0009 | 80a5 | a200 | a805 | 2001 | 9010 | 2030 |
| 3146740 | d02c | 4016 | 80a5 | 0012 | 06bf | fff9 | ac05 | a001 | 80a5 | a200 | 3680 | 0005 | 9210 | 2001 | fa2c | 4016 | 1080 | 0003 | ac05 | a001 | d226 | e20c | fa07 | bff4 |
| 3147020 | a404 | a001 | ba25 | 801d | 80a4 | 801d | 3280 | 0007 | 80a5 | 401d | de06 | e008 | a604 | e001 | 9e23 | c013 | 1080 | 0009 | de26 | e008 | 2480 | 0005 | d406 | e008 |
| 3147100 | aa25 | 401d | 1080 | 0004 | ea26 | e008 | 9422 | 801d | d426 | e008 | 80a5 | c019 | aa10 | 2000 | 1680 | 0006 | a610 | 2000 | b006 | 2001 | fa4e | 0000 | 10bf | ff6a |
| 3147160 | ae05 | e001 | 10bf | ff68 | ba10 | 2000 | de07 | a058 | 80a6 | a002 | 1680 | 0006 | f023 | c000 | d007 | bff8 | 80a2 | 3fff | 22bf | fe0a | 80a6 | a002 | d207 | bff8 |
| 3147240 | 8090 | 0009 | 2480 | 0065 | 80a7 | 602b | d406 | e008 | 9402 | 8015 | 1080 | 0060 | d426 | e008 | 8090 | 001a | 32bf | fff0 | de07 | a058 | d807 | bff8 | 8090 | 000c |
| 3147320 | 24bf | fdfb | 80a6 | a002 | da06 | e008 | 9a03 | 4015 | 10bf | fdf6 | da26 | e008 | 9027 | 6020 | 80a2 | 2045 | 18bf | fff6 | 1500 | 052d | 9332 | 2005 | 932a | 6001 |
| 3147400 | 9202 | 4008 | 9810 | 201f | 920a | 400c | 932a | 6003 | 9412 | a3c4 | d602 | 400a | 80a2 | c008 | 32bf | ffec | d807 | bff8 | 9202 | 400a | d002 | 6004 | 81c2 | 0000 |
| 3147460 | 0100 | 0000 | 0000 | 0003 | 0014 | b4cc | ffff | ffff | 0014 | b758 | ffff | ffff | 0014 | b758 | ffff | ffff | 0014 | b758 | ffff | ffff | 0014 | b758 | ffff | ffff |
| 3147540 | 0014 | b758 | 0000 | 0024 | 0014 | b74c | 0000 | 0025 | 0014 | b70c | 0000 | 0044 | 0014 | b74c | 0000 | 0045 | 0014 | b70c | ffff | ffff | 0014 | b758 | 0000 | 000b |
| 3147620 | 0014 | b74c | ffff | ffff | 0014 | b758 | 0000 | 000d | 0014 | b74c | ffff | ffff | 0014 | b758 | ffff | ffff | 0014 | b758 | 0000 | 0010 | 0014 | b508 | 0000 | 0011 |
| 3147700 | 0014 | b5bc | 0000 | 0012 | 0014 | b5c4 | 0000 | 0013 | 0014 | b5cc | 0000 | 0014 | 0014 | b5d4 | 0000 | 0015 | 0014 | b5dc | 0000 | 0016 | 0014 | b5e4 | 0000 | 0017 |
| 3147760 | 0014 | b5ec | 0000 | 0018 | 0014 | b5f4 | 0000 | 0019 | 0014 | b5fc | ffff | ffff | 0014 | b758 | ffff | ffff | 0014 | b758 | ffff | ffff | 0014 | b758 | ffff | ffff |
| 3150040 | 0014 | b758 | ffff | ffff | 0014 | b758 | ffff | ffff | 0014 | b758 | 80a7 | 602b | a810 | 2000 | 0280 | 001a | aa10 | 2000 | 80a7 | 602d | 2280 | 0018 | 80a7 | 602b |
| 3150120 | 80a5 | c019 | 3680 | 0005 | ba10 | 2000 | b006 | 2001 | fa4e | 0000 | ae05 | e001 | 80a6 | a002 | 2680 | 000f | 80a7 | 602b | 80a7 | 6020 | 3280 | 000c | 80a7 | 602b |
| 3150200 | 80a5 | c019 | 3680 | 0005 | ba10 | 2000 | b006 | 2001 | fa4e | 0000 | ae05 | e001 | 80a7 | 6020 | 22bf | fffa | 80a5 | c019 | 80a7 | 602b | 3280 | 000b | 80a7 | 602d |
| 3150260 | 80a5 | c019 | 1680 | 0006 | 0100 | 0000 | b006 | 2001 | fa4e | 0000 | 1080 | 000d | ae05 | e001 | 1080 | 000b | ba10 | 2000 | 3280 | 000a | 80a7 | 6030 | 80a5 | c019 |
| 3150340 | 3680 | 0005 | ba10 | 2000 | b006 | 2001 | fa4e | 0000 | ae05 | e001 | a810 | 2001 | 80a7 | 6030 | 1f05 | f5e1 | 0680 | 004b | a610 | 000f | 80a7 | 6039 | 0480 | 004c |
| 3150420 | 80a7 | 6020 | 3280 | 0050 | 80a5 | 2001 | 80a7 | 6020 | 3280 | 0012 | 80a5 | 4013 | 80a6 | a002 | 2680 | 004a | 80a5 | 2001 | 80a6 | a002 | 3280 | 000b | ba10 | 2030 |
| 3150500 | 80a5 | c019 | 1680 | 0006 | 0100 | 0000 | b006 | 2001 | fa4e | 0000 | 1080 | 0030 | ae05 | e001 | 1080 | 002e | ba10 | 2000 | 80a5 | 4013 | 1880 | 0007 | a010 | 0018 |
| 3150560 | ab2d | 6001 | 972d | 6002 | aa05 | 400b | aa05 | 401d | aa25 | 6030 | 80a5 | c019 | 1680 | 0006 | 0100 | 0000 | b006 | 2001 | fa4e | 0000 | 1080 | 0010 | ae05 | e001 |
| 3150640 | 1080 | 000e | ba10 | 2000 | 9410 | 2006 | 1080 | 001a | d427 | 0000 | 9610 | 2007 | 1080 | 0017 | d627 | 0000 | 9810 | 2008 | 1080 | 0014 | d827 | 0000 | 9a10 | 2009 |
| 3150720 | 1080 | 0011 | da27 | 0000 | d007 | 0000 | 9022 | 2001 | 80a2 | 2004 | 1880 | 000c | 912a | 2002 | 1300 | 052e | 9212 | 6290 | d002 | 0009 | 81c2 | 0000 | 0100 | 0000 |
| 3151000 | 0014 | ba38 | 0014 | ba38 | 0014 | ba44 | 0014 | ba50 | 0014 | ba5c | 80a7 | 6030 | 2680 | 0006 | 80a7 | 6020 | 80a7 | 6039 | 2480 | 0006 | 80a7 | 6020 | 80a7 | 6020 |
| 3151060 | 3280 | 0009 | 80a5 | 2001 | 80a7 | 6020 | 32bf | ffcb | 80a5 | 4013 | 80a6 | a002 | 36bf | ffbc | 80a6 | a002 | 80a5 | 2001 | 3280 | 0006 | d206 | e008 | de06 | e008 |
| 3151140 | 9e23 | c015 | 10bf | fd15 | de26 | e008 | 9202 | 4015 | 10bf | fd12 | d226 | e008 | 80a7 | 6020 | 3280 | 000c | 8090 | 0010 | 80a5 | c019 | 36bf | fffc | ba10 | 2000 |
| 3151220 | b006 | 2001 | d84e | 0000 | ae05 | e001 | 80a3 | 2020 | 22bf | fffa | 80a5 | c019 | 8090 | 0010 | 3280 | 0004 | d007 | bff8 | a026 | 2001 | d007 | bff8 | 80a2 | 2001 |

| | | | | | | | | | | | | | | | | | | | | | | | | |
|---|---|---|---|---|---|---|---|---|---|---|---|---|---|---|---|---|---|---|---|---|---|---|---|---|
| 3151300 | 3680 | 0004 | 9206 | e00c | c026 | c000 | 9206 | e00c | c02a | 4016 | d407 | bffc | 80a4 | 000a | 2a80 | 0006 | c027 | 0000 | d807 | a044 | a004 | 2001 | 1080 | 0008 |
| 3151360 | e023 | 0000 | da07 | a044 | de07 | bffc | 9010 | 2005 | de23 | 4000 | c026 | e004 | d026 | c000 | 81c7 | e008 | 81e8 | 0000 | 0000 | 0000 | 9de3 | bd78 | f027 | a044 |
| 3151440 | f227 | a048 | 1100 | 03d2 | d002 | 2370 | 9210 | 2001 | d227 | bff8 | d027 | bff4 | 9007 | a044 | 9207 | bff4 | f427 | bffc | 9407 | bde0 | 4000 | 0ad5 | 9607 | bddc |
| 3151520 | d407 | bde4 | d427 | 0000 | d007 | bde0 | 80a2 | 2005 | 1890 | 0039 | 912a | 2002 | 1300 | 052f | 9212 | 600c | d002 | 0009 | 81c2 | 0000 | 0100 | 0000 | 0014 | bc54 |
| 3151600 | 0014 | bc24 | 0014 | bc24 | 0014 | bc7c | 0014 | bc98 | 0014 | bc98 | d607 | bde8 | b807 | bdec | 9602 | c01a | d626 | c000 | b610 | 2000 | 80a6 | c01a | 3680 | 0026 |
| 3151660 | c02f | 401a | de4e | c01c | de2f | 401b | 10bf | fffb | b606 | e001 | a010 | 2001 | e026 | c000 | b610 | 2000 | 80a6 | c01a | 3680 | 001c | c02f | 401a | a210 | 2030 |
| 3151740 | e22f | 401b | 10bf | fffb | b606 | e001 | 80a6 | a008 | 2500 | 054a | c026 | c000 | 0680 | 0007 | b804 | a1cc | 1080 | 0006 | b410 | 2008 | 2700 | 054a | b804 | e1c8 |
| 3152020 | c026 | c000 | b410 | 2003 | b610 | 2000 | 80a6 | c01a | 3680 | 0009 | c02f | 401a | e84f | 001b | e82f | 401b | b606 | e001 | 80a6 | c01a | 26bf | fffd | e84f | 001b |
| 3152100 | c02f | 401a | 81c7 | e008 | 91e8 | 001d | 9de3 | bd78 | f027 | a044 | f227 | a048 | 1100 | 03d2 | d002 | 2370 | c027 | bff8 | d027 | bff4 | 9007 | a044 | f427 | bffc |
| 3152160 | 9207 | bff4 | 9407 | bde0 | 4000 | 0a89 | 9607 | bddc | d207 | bde4 | d227 | 0000 | d007 | bde0 | 80a2 | 2005 | 1880 | 0042 | 912a | 2002 | 1300 | 052f | 9212 | 613c |
| 3152240 | d002 | 0009 | 81c2 | 0000 | 0100 | 0000 | 0014 | bdac | 0014 | bd54 | 0014 | bd54 | 0014 | bdd0 | 0014 | bdec | 0014 | bdec | 8090 | 001a | 2680 | 0006 | d807 | bff0 |
| 3152320 | d407 | bff0 | 9422 | 801a | 1080 | 0003 | d426 | c000 | d826 | c000 | de07 | bff0 | b610 | 2000 | 80a6 | c00f | 1680 | 0009 | b407 | bdec | e04e | c01a | e02f | 401b |
| 3152400 | de07 | bff0 | b606 | e001 | 80a6 | c00f | 26bf | fffc | e04e | c01a | 1080 | 0021 | c02f | 400f | c026 | c000 | b610 | 2000 | 80a6 | c01a | 3680 | 001c | c02f | 401a |
| 3152460 | a410 | 2030 | e42f | 401b | 10bf | fffb | b606 | e001 | 80a6 | a008 | 2700 | 054a | c026 | c000 | 0680 | 0007 | b804 | e1cc | 1080 | 0006 | b410 | 2008 | 2900 | 054a |
| 3152540 | b805 | 21c8 | c026 | c000 | b410 | 2003 | b610 | 2000 | 80a6 | c01a | 3680 | 0009 | c02f | 401a | ea4f | 001b | ea2f | 401b | b606 | e001 | 80a6 | c01a | 26bf | fffd |
| 3152620 | ea4f | 001b | c02f | 401a | 81c7 | e008 | 91e8 | 001d | 033f | fff3 | 8200 | 6358 | 9de3 | 8001 | 80a6 | 6001 | f627 | a050 | 0a80 | 013f | f427 | a04c | f44e | 0000 |
| 3152700 | ba10 | 2001 | 80a7 | 4019 | 1a80 | 000e | b426 | a030 | 80a7 | 6009 | 3680 | 000c | 1700 | 003f | 9f2e | a001 | 9b2e | a003 | f44e | 001d | ba07 | 6001 | 9e03 | c00d |
| 3152760 | b403 | c01a | 80a7 | 4019 | 0abf | fff6 | b426 | a030 | 1700 | 003f | 9612 | e3ff | 153f | fff3 | 9412 | a3c0 | 960e | 800b | d627 | 800a | b536 | a010 | 9002 | a004 |
| 3153040 | f427 | 8008 | d007 | 8008 | 8090 | 0008 | 2280 | 0003 | b410 | 2000 | b410 | 2001 | ea07 | a050 | a826 | 6003 | 80a7 | 4014 | b72e | a002 | ac07 | 800a | 2500 | 0034 |
| 3153120 | b606 | c016 | 1680 | 002d | ae04 | a050 | b806 | 001d | e44f | 0000 | d44f | 2001 | da4f | 2002 | f84f | 2003 | a52c | a001 | 912c | a002 | a404 | 8008 | 9404 | 800a |
| 3153200 | 952a | a001 | 992a | a002 | 9402 | 800c | 9402 | 800d | 952a | a001 | a52a | a002 | 9402 | 8012 | 9402 | 801c | 273f | fff3 | a614 | e3bc | 9422 | 8017 | d427 | 8013 |
| 3153260 | b806 | a001 | 9210 | 001c | 9407 | 9013 | 4000 | 101c | 9010 | 0016 | e007 | 8013 | 8090 | 0010 | 2280 | 000c | ba07 | 6004 | 80a7 | 2c10 | b410 | 001c | 0680 | 0005 |
| 3153340 | b606 | e004 | 2500 | 1fff | 1080 | 00f1 | a414 | a3ff | e607 | 8013 | e626 | c000 | ba07 | 6004 | 80a7 | 4014 | 26bf | ffd8 | b806 | 001d | b226 | 401d | 80a6 | 6001 |
| 3153420 | b610 | 2000 | 0280 | 0027 | 80a6 | 6002 | 0280 | 0018 | 80a6 | 6003 | 3280 | 002a | 8090 | 001b | ba06 | 001d | da4f | 4000 | e24f | 6001 | fa4f | 6002 | 9b2b | 6001 |
| 3153500 | 9f2b | 6002 | 9a03 | 400f | a203 | 4011 | a32c | 6001 | 912c | 6002 | a204 | 4008 | 1b00 | 0005 | 9a13 | 60d0 | a204 | 401d | 173f | fff3 | 9612 | e3bc | a224 | 400d |
| 3153560 | b610 | 23e8 | 1080 | 0015 | e227 | 800b | ba06 | 001d | 124f | 4000 | fa4f | 6001 | 932a | 6001 | 952a | 6002 | 9202 | 400a | 9202 | 401d | 253f | fff3 | a414 | a3bc |
| 3153640 | 9222 | 6210 | b610 | 2064 | 1080 | 0008 | d227 | 8012 | f04e | 001d | 233f | fff3 | a214 | 63bc | b026 | 2030 | f027 | 8011 | b610 | 200a | 8090 | 001b | 2280 | 0029 |
| 3153720 | e607 | a04c | b210 | 001a | ba10 | 2000 | 80a7 | 4019 | 1900 | 003f | 1880 | 0012 | b003 | 23ff | af2f | 6002 | ae05 | c016 | d005 | c000 | 4000 | 0f28 | 9210 | 001b |
| 3154000 | 173f | fff3 | 9612 | e3bc | e407 | 800b | ba07 | 6001 | a402 | 0012 | 9934 | a010 | d827 | 800b | a40c | 8018 | 80a7 | 4019 | 08bf | fff2 | e425 | c000 | 1f3f | fff3 |
| 3154060 | 9e13 | e3bc | e007 | 800f | 8090 | 0010 | 2280 | 000d | e607 | a04c | b406 | a001 | 80a6 | ac10 | 2680 | 0006 | de07 | 800f | 2300 | 1fff | a214 | 63ff | 1080 | 0095 |
| 3154140 | e225 | 4000 | a52e | a002 | de24 | 8016 | e607 | a04c | ba10 | 2000 | ae24 | e003 | 80a7 | 4017 | b32e | a002 | b010 | 2000 | b800 | 0016 | 1680 | 0023 | b206 | 4016 |
| 3154220 | 293f | fff3 | a815 | 23bc | 9226 | 8018 | 9202 | 6001 | c027 | 8014 | 9407 | 8014 | 4000 | 0fa1 | 9010 | 001c | d007 | 8014 | a406 | a001 | 8090 | 0008 | 2280 | 000d |
| 3154300 | da07 | 0000 | 80a4 | ac10 | b410 | 0012 | 0680 | 0006 | b206 | 6004 | 1500 | 1fff | 9412 | a3ff | 1080 | 0075 | d425 | 4000 | e807 | 8014 | e826 | 4000 | da07 | 0000 |
| 3154360 | 8090 | 000d | 3280 | 0005 | ba07 | 6004 | b807 | 2004 | b006 | 2001 | ba07 | 6004 | 80a7 | 4017 | 26bf | ffe2 | 293f | fff3 | a624 | c01d | 80a4 | e001 | b610 | 2000 |
| 3154440 | 0280 | 000a | 80a4 | e002 | 0280 | 0006 | 80a4 | e003 | 3280 | 0008 | 8090 | 001b | 1080 | 0005 | b610 | 23e8 | 1080 | 0003 | b610 | 2064 | b610 | 200a | 8090 | 001b |
| 3154520 | 2280 | 002c | b72e | a002 | ba10 | 0018 | b210 | 001a | 213f | fff3 | a014 | 23bc | 80a7 | 4019 | 2500 | 003f | c027 | 8010 | 1880 | 0012 | b004 | a3ff | af2f | 6002 |
| 3154600 | ae05 | c016 | d005 | c000 | 4000 | 0ec4 | 9210 | 001b | 133f | fff3 | 9212 | 63bc | d807 | 8009 | ba07 | 6001 | 9802 | 000c | a333 | 2010 | e227 | 8009 | 980b | 0018 |
| 3154660 | 80a7 | 4019 | 08bf | fff2 | d825 | c000 | 113f | fff3 | 9012 | 23bc | d207 | 9008 | 8090 | 0009 | 2280 | 000d | b72e | a002 | b406 | a001 | 80a6 | ac10 | 2680 | 0006 |
| 3154740 | d007 | 8008 | 1500 | 1fff | 9412 | a3ff | 1080 | 0031 | d425 | 4000 | 972e | a002 | d022 | c016 | b72e | a002 | b005 | 6004 | b800 | 0018 | b606 | c016 | ba10 | 2000 |
| 3155020 | 80a7 | 401a | 3480 | 000a | 80a7 | 6006 | d206 | c000 | ba07 | 6001 | 80a7 | 6006 | d227 | 0000 | b626 | e004 | 06bf | fff8 | b807 | 2004 | 80a7 | 6006 | b92f | 6002 |
| 3155100 | 1680 | 0007 | b807 | 0018 | ba07 | 6001 | 80a7 | 6006 | c027 | 0000 | 06bf | fffd | b807 | 2004 | b92f | 6002 | b807 | 0016 | de07 | 0000 | 8090 | 000f | 1280 | 000a |
| 3155160 | 80a7 | 401a | 3480 | 0008 | 80a7 | 401a | b807 | 2004 | de07 | 0000 | ba07 | 6001 | 8090 | 000f | 02bf | fffa | 80a7 | 401a | 3480 | 0006 | a406 | a001 | e005 | 6018 |
| 3155240 | a014 | 2001 | e025 | 6018 | a406 | a001 | e425 | 4000 | 91c7 | e008 | 81e8 | 0000 | 033f | fff3 | 8200 | 6358 | 9de3 | 8001 | a610 | 0019 | 1300 | 000c | 9212 | 6040 |
| 3155320 | 9006 | 8013 | 80a2 | 0009 | f827 | a054 | f227 | a048 | 0880 | 0006 | f027 | a044 | 153e | 0000 | 9412 | a001 | 1080 | 0134 | d426 | c000 | a210 | 2003 | a20e | 8011 |
| 3155400 | 80a4 | 6003 | bb36 | a002 | b210 | 001d | aa10 | 0018 | a32c | 6002 | 1880 | 0046 | ac10 | 0019 | 1300 | 0530 | 9212 | 63c0 | d004 | 4009 | 81c2 | 0000 | 0100 | 0000 |
| 3155460 | 0014 | c3d0 | 0014 | c3dc | 0014 | c450 | 0014 | c498 | b410 | 2000 | 1080 | 003a | b410 | 2000 | f84d | 4000 | 80a4 | e002 | b827 | 2030 | b92f | 2002 | a32f | 2003 |
| 3155540 | b807 | 0011 | a32c | 6001 | 0a80 | 0008 | b807 | 0011 | d44d | 6001 | 9422 | a030 | 952a | a001 | 992a | a002 | 9402 | 800c | b807 | 000a | 80a4 | e003 | 2a80 | 0006 |
| 3155620 | 133f | fff3 | e04d | 6002 | a024 | 2030 | b807 | 0010 | 133f | fff3 | 9212 | 63c0 | 9207 | 8009 | 972e | 6002 | ac06 | 6001 | b410 | 2003 | 1080 | 001d | f822 | c009 |
| 3155700 | f84d | 4000 | 80a4 | e002 | b827 | 2030 | b92f | 2001 | a32f | 2002 | 0a80 | 0005 | b807 | 0011 | d44d | 6001 | 9422 | a030 | b807 | 000a | 1b3f | fff3 | 9a13 | 63c0 |
| 3155760 | 9a07 | 800d | a12e | 6002 | ac06 | 6001 | b410 | 2002 | 1080 | 000b | f824 | 000d | f84d | 4000 | 193f | fff3 | 9813 | 23c0 | 9807 | 800c | b827 | 2030 | 9f2e | 6002 |
| 3156040 | f823 | c00c | b410 | 2001 | ac06 | 6001 | 80a4 | e004 | 0a80 | 0067 | ae10 | 001c | 113f | fff3 | 9012 | 23c0 | b807 | 8008 | 972d | a002 | b802 | c01c | a824 | e003 |
| 3156120 | 80a6 | 8014 | 3a80 | 005f | a624 | c01a | b005 | 401a | e24e | 2001 | d64e | 0000 | a224 | 6030 | 9622 | e030 | 972a | e001 | 992a | e002 | 9602 | c00c | 9602 | c011 |
| 3156200 | e24e | 2002 | f04e | 2003 | 972a | e001 | 9f2a | e002 | 9602 | c00f | a224 | 6030 | 9602 | c011 | 972a | e001 | 952a | e002 | 9602 | c00a | b026 | 2030 | 9602 | c018 |
| 3156260 | d627 | 0000 | ac05 | a001 | b406 | a004 | ae15 | c00b | 10bf | ffe4 | b807 | 2004 | ea4d | 401a | 233f | fff3 | aa25 | 6030 | ab2d | 6003 | 9b2d | 6002 | aa25 | 400d |
| 3156340 | 9b2b | 6005 | a214 | 63c0 | 932d | a002 | a207 | 8011 | aa05 | 400d | ac05 | a001 | 1080 | 003d | ea22 | 4011 | aa05 | 401a | d04d | 6001 | ea4d | 4000 | 9022 | 2030 |

| | | | | | | | | | | | | | | | | | | | | | | | | |
|---|---|---|---|---|---|---|---|---|---|---|---|---|---|---|---|---|---|---|---|---|---|---|---|---|
| 3156420 | 912a | 2002 | 952a | 2003 | aa25 | 6030 | ab2d | 6003 | 9002 | 000a | 952a | a001 | 9f2d | 6002 | aa25 | 400f | 9002 | 000a | 9f2b | e005 | aa05 | 400f | aa05 | 4008 |
| 3156500 | 113f | fff3 | 9012 | 23c0 | 952d | a002 | 9007 | 8008 | ac05 | a001 | 1080 | 0026 | ea22 | 8008 | da4d | 6001 | d04d | 4000 | ea4d | 6002 | 9a23 | 6030 | 9b2b | 6002 |
| 3156560 | a12b | 6003 | 9c22 | 2030 | 912a | 2003 | 9a03 | 4010 | a12c | 2001 | 952a | 2002 | 9022 | 000a | 9a03 | 4010 | aa25 | 6030 | ab2d | 6001 | 952a | a005 | 9002 | 000a |
| 3156640 | a12d | 6002 | 133f | fff3 | 9212 | 63c0 | aa05 | 4010 | 9002 | 000d | 972d | a002 | aa02 | 0015 | 9207 | 8009 | ac05 | a001 | 1080 | 000a | ea22 | c009 | a624 | c01a |
| 3156720 | 80a4 | e001 | 02bf | ffbd | 80a4 | e002 | 02bf | ffc9 | 80a4 | e003 | 22bf | ffde | aa05 | 401a | aa10 | 0016 | 80a5 | 401d | 2880 | 000a | 8090 | 0017 | 233f | fff3 |
| 3157000 | a214 | 63c0 | 9e25 | a001 | 9f2b | e002 | a207 | 8011 | 1e03 | c011 | ae15 | c00f | 8090 | 0017 | 3280 | 000a | e807 | a054 | c026 | c000 | c026 | e004 | c026 | e008 |
| 3157060 | c026 | e00c | c026 | e010 | c026 | e014 | 1080 | 0061 | c026 | e018 | 193f | fff3 | a935 | 2004 | a805 | 2002 | 9813 | 23c0 | a625 | a001 | b810 | 2000 | 80a7 | 0014 |
| 3157140 | a72c | e002 | ae07 | 800c | b410 | 2000 | b010 | 2000 | 1a80 | 0035 | a604 | c017 | 153f | fff3 | 9412 | a3bc | c027 | 800a | 9225 | 401d | 9220 | 0009 | 9407 | 800a |
| 3157220 | 4000 | 0e5c | 9010 | 0013 | 8090 | 001a | 2280 | 001e | 233f | fff3 | 1f3f | fff3 | 9e13 | e3bc | de07 | 800f | 992e | a002 | 9606 | e004 | b807 | 2001 | b406 | a001 |
| 3157300 | 1080 | 001a | 1e22 | c00c | 2280 | 000b | 9210 | 0011 | ba27 | 6001 | b210 | 001d | 932e | 6002 | a010 | 0011 | d007 | 8010 | 4000 | 0e07 | 9202 | 4017 | 1080 | 0009 |
| 3157360 | d027 | 8010 | e207 | 8009 | 9f2e | a002 | 9a06 | e004 | e223 | 400f | c027 | 8009 | b406 | a001 | b807 | 2001 | 233f | fff3 | a214 | 63bc | d007 | 8011 | 8090 | 0008 |
| 3157440 | 32bf | ffea | 8090 | 001d | 8090 | 001a | 3280 | 0004 | 80a7 | 0014 | b006 | 2001 | 80a7 | 0014 | 2abf | ffd0 | 153f | fff3 | ba10 | 001c | 80a7 | 6006 | b020 | 0018 |
| 3157520 | b52f | 6002 | 1680 | 0008 | f026 | c000 | ba07 | 6001 | 9e06 | e004 | c023 | c01a | 80a7 | 6006 | 06bf | fffc | b406 | a004 | ba10 | 0019 | 80a7 | 4016 | b52e | 6002 |
| 3157600 | 1680 | 000a | b406 | 8017 | d006 | 8000 | 8090 | 0008 | 3280 | 0007 | 80a7 | 4016 | ba07 | 6001 | 80a7 | 4016 | 06bf | fffa | b406 | a004 | 80a7 | 4016 | 1680 | 0005 |
| 3157660 | 0100 | 0000 | d206 | e018 | 9212 | 6001 | d226 | e018 | 81c7 | e008 | 81e8 | 0000 | 9de3 | bf68 | f427 | a04c | d006 | 6004 | b410 | 2000 | d026 | 0000 | d206 | 4000 |
| 3157740 | d226 | 2004 | d406 | 2004 | 80a2 | a002 | 2280 | 0007 | b605 | 600c | d606 | 2004 | 80a2 | e001 | 1280 | 00d6 | 0100 | 0000 | b606 | 600c | ba10 | 2000 | da4e | c01d |
| 3160020 | 8090 | 000d | 2280 | 0008 | 8090 | 001d | ba07 | 6001 | 1a4e | c01d | 8090 | 000d | 32bf | fffe | ba07 | 6001 | 8090 | 001d | 3280 | 0004 | e206 | 6008 | 1080 | 00c6 |
| 3160100 | c026 | 2004 | 8090 | 0011 | 2680 | 0007 | d206 | 6008 | ea06 | 6008 | b810 | 001d | ac10 | 2000 | 1080 | 0013 | ae10 | 2000 | 9220 | 0009 | 80a7 | 4009 | 3880 | 000a |
| 3160160 | f806 | 6008 | e806 | 6008 | b810 | 2000 | a820 | 0014 | aa10 | 2000 | ac10 | 2000 | ae10 | 001d | 1080 | 0008 | a825 | 001d | ee06 | 6008 | b807 | 401c | ac10 | 001c |
| 3160240 | ae20 | 0017 | aa10 | 2000 | a810 | 2000 | 8090 | 001c | 2280 | 0011 | c027 | bfe4 | 9410 | 0015 | 9010 | 001b | 9210 | 001c | 7fff | fd37 | 9607 | bfe4 | d807 | bfe4 |
| 3160320 | 1b00 | 1fff | 9a13 | 63ff | 80a3 | 000d | 3280 | 0008 | e207 | bfe4 | 2120 | 0000 | d926 | 2008 | 1080 | 009a | e026 | 200c | c027 | bfe8 | e207 | bfe4 | e607 | a04c |
| 3160400 | 80a4 | 6001 | 3480 | 0004 | b92c | 6004 | 1080 | 0004 | b804 | e001 | a604 | e011 | b824 | c01c | 8090 | 0017 | 2280 | 005a | f406 | 620c | 8090 | 001c | 2480 | 0057 |
| 3160460 | f406 | 620c | 9410 | 0014 | 9210 | 0017 | 9810 | 001c | 9607 | bfc8 | 7fff | fe53 | 9006 | c016 | e207 | bfe8 | 8090 | 0011 | 3280 | 0014 | d007 | bffc | e407 | bfc8 |
| 3160540 | 113e | 0000 | 9012 | 2001 | 80a4 | 8008 | 3280 | 0006 | 9e10 | 201c | 1520 | 0000 | e426 | 2008 | 1080 | 0076 | d426 | 200c | 9807 | bfc8 | 9607 | bfe4 | 9ea3 | e004 |
| 3160620 | da03 | 000f | 12bf | fffe | da22 | c00f | 1080 | 0054 | 8090 | 001a | fa07 | bfc8 | e007 | bfe4 | 808a | 2001 | 0280 | 0006 | ba24 | 001d | d207 | bffc | b410 | 2001 |
| 3160700 | 920a | 7ffe | d227 | bffc | 80a7 | 6005 | 3480 | 0010 | b610 | 2005 | 9610 | 2005 | 9622 | c01d | 972a | e002 | 9407 | bfcc | 9602 | c00a | e002 | c000 | 808c | 2001 |
| 3160760 | 2280 | 0007 | b610 | 2005 | e202 | c000 | b410 | 2001 | a20c | 7ffe | e222 | c000 | b610 | 2005 | b626 | c01d | b210 | 2000 | 80a6 | 401b | bb2f | 6002 | 9207 | bfe8 |
| 3161040 | ae07 | bfcc | ba07 | 4009 | 1480 | 000b | b800 | 0017 | e207 | 4000 | e407 | 0000 | b206 | 6001 | a204 | 4012 | e227 | 4000 | 80a6 | 401b | b807 | 2004 | 04bf | fff9 |
| 3161120 | ba07 | 6004 | bb2e | 6002 | ba07 | 4017 | 80a6 | 6005 | 3480 | 0023 | 8090 | 001a | d607 | 4000 | 8090 | 000b | 2280 | 0004 | b206 | 6001 | b410 | 2001 | b206 | 6001 |
| 3161200 | 10bf | fff7 | ba07 | 6004 | 8090 | 001a | 3280 | 0018 | 8090 | 001a | 8090 | 0017 | 2280 | 0015 | 8090 | 001a | b210 | 0016 | b810 | 0019 | 80a7 | 001d | 3a80 | 000c |
| 3161260 | 80a7 | 001d | e24e | c019 | 80a4 | 6030 | 3280 | 0008 | 80a7 | 001d | b206 | 6001 | b810 | 0019 | 80a7 | 001d | 2abf | fffa | e24e | c019 | 80a7 | 001d | 3a80 | 0004 |
| 3161340 | 8090 | 001a | b410 | 2001 | 8090 | 001a | 2280 | 0006 | 1207 | bfe4 | d007 | bffc | 9012 | 2001 | d027 | bffc | d207 | bfe4 | 932a | 6004 | 9222 | 6001 | d226 | 2008 |
| 3161420 | d807 | bfe8 | de07 | bfec | 992b | 2010 | 9803 | 000f | d826 | 200c | e207 | bff0 | d007 | bff4 | a32c | 6010 | a204 | 4008 | e226 | 2010 | d407 | bff8 | d807 | bffc |
| 3161500 | 952a | a010 | 9402 | 800c | d426 | 2014 | 4000 | 0a00 | 9010 | 0018 | 81c7 | e008 | 81e8 | 0000 | 9de3 | bf80 | d006 | a004 | 8090 | 0008 | 2280 | 0003 | ba10 | 2000 |
| 3161560 | ba10 | 2001 | d60f | bffc | bb2f | 6007 | 962a | e080 | 9612 | c01d | d62f | bffc | d006 | 8000 | 80a2 | 2005 | 1880 | 0038 | 912a | 2002 | 1300 | 0533 | 9212 | 603c |
| 3161640 | d002 | 0009 | 81c2 | 0000 | 0100 | 0000 | 0014 | cc54 | 0014 | cd00 | 0014 | cd00 | 0014 | cc7c | 0014 | cca4 | 0014 | cccc | da17 | bffc | 1f00 | 001f | 9e13 | e380 |
| 3161720 | 9a2b | 400f | da37 | bffc | e007 | bffc | 233f | e000 | a00c | 0011 | 1080 | 006e | e027 | bffc | e417 | bffc | 2700 | 001f | a614 | e380 | a414 | 8013 | e437 | bffc |
| 3162000 | e807 | bffc | 2b3f | e000 | a80d | 0015 | 1080 | 0064 | e827 | bffc | ec17 | bffc | 2f00 | 001f | ae15 | e380 | ac15 | 8017 | ec37 | bffc | d007 | bffc | 133f | e000 |
| 3162060 | 9032 | 0009 | 1080 | 005a | d027 | bffc | d417 | bffc | 1700 | 001f | 9612 | e380 | 9412 | 800b | d437 | bffc | e007 | bffc | 1f3f | e000 | 1900 | 0fff | 9813 | 23ff |
| 3162140 | a00c | 000f | a014 | 000c | 1080 | 004d | e027 | bffc | e206 | a008 | 80a4 | 6061 | 2480 | 0010 | ec06 | a008 | f406 | a004 | 8090 | 001a | 3280 | 0003 | ba10 | 2001 |
| 3162220 | ba10 | 2000 | 2900 | 03ff | a815 | 23ff | 2b20 | 0000 | a610 | 2002 | fa27 | bfe4 | e827 | bfec | ea27 | bff0 | 1080 | 0031 | e527 | bfe8 | 80a5 | bf9f | 3680 | 002b |
| 3162300 | 9410 | 2018 | ee06 | a008 | 80a5 | fd9f | 2480 | 001a | f406 | a004 | b806 | a00c | ba10 | 2000 | d24f | 001d | 8090 | 0009 | 2280 | 000e | de06 | a008 | d606 | a008 |
| 3162360 | 9620 | 000b | 9622 | e061 | 80a7 | 400b | 3680 | 0008 | de06 | a008 | ba07 | 6001 | d24f | 001d | 8090 | 0009 | 32bf | fff8 | d606 | a008 | de06 | a008 | 9e20 | 000f |
| 3162440 | 9e23 | e061 | 80a7 | 400f | 3680 | 0010 | 9410 | 2018 | f406 | a004 | 8090 | 001a | 3280 | 0003 | ba10 | 2001 | ba10 | 2000 | 293f | fc00 | a815 | 2001 | 2b20 | 0000 |
| 3162520 | a610 | 2002 | fa27 | bfe4 | e827 | bfec | ea27 | bff0 | 1080 | 0005 | e627 | bfe8 | 9210 | 001a | 7fff | fe97 | 9007 | bfe4 | 2100 | 054a | c024 | 2238 | f206 | 4000 |
| 3162600 | 1100 | 054a | f222 | 2234 | 9007 | bfe4 | 4000 | 0729 | 9207 | bffc | e004 | 2238 | e026 | c000 | d407 | bffc | d426 | 0000 | 81c7 | e008 | 81e8 | 0000 | 9de3 | bf80 |
| 3162660 | d006 | a004 | 8090 | 0008 | 2280 | 0003 | ba10 | 2000 | ba10 | 2001 | d60f | bff8 | bb2f | 6007 | 962a | e080 | 9612 | c01d | d62f | bff8 | d006 | 8000 | 80a2 | 2005 |
| 3162740 | 1880 | 003e | 912a | 2002 | 1300 | 0533 | 9212 | 628c | d002 | 0009 | 81c2 | 0000 | 0100 | 0000 | 0014 | cea4 | 0014 | cf68 | 0014 | cf68 | 0014 | ced0 | 0014 | cefc |
| 3163020 | 0014 | cf2c | da17 | bff8 | 1f00 | 001f | 9e13 | e3f0 | 9a2b | 400f | da37 | bff8 | e007 | bff8 | 233f | fc00 | a00c | 0011 | c027 | bffc | 1080 | 0073 | e027 | bff8 |
| 3163100 | e417 | bff8 | 2700 | 001f | a614 | e3f0 | a414 | 8013 | e437 | bff8 | e807 | bff8 | 2b3f | fc00 | a80d | 0015 | c027 | bffc | 1080 | 0068 | e827 | bff8 | ec17 | bff8 |
| 3163160 | 2f00 | 001f | ae15 | e3f0 | ac15 | 8017 | ec37 | bff8 | d007 | bff8 | 133f | fc00 | 9032 | 0009 | 9410 | 3fff | d027 | bff8 | 1080 | 005c | d427 | bffc | d617 | bff8 |
| 3163240 | 1900 | 001f | 9813 | 23f0 | 9612 | c00c | d637 | bff8 | e207 | bff8 | 213f | fc00 | 1b00 | 01ff | 9a13 | 63ff | a20c | 4010 | a214 | 400d | a410 | 3fff | e227 | bff8 |
| 3163320 | 1080 | 004d | e427 | bffc | e606 | a008 | 80a4 | e303 | 2480 | 0010 | d006 | a008 | f406 | a004 | 8090 | 001a | 3280 | 0003 | ba10 | 2001 | ba10 | 2000 | 2d00 | 03ff |
| 3163400 | ac15 | a3ff | 2f20 | 0000 | aa10 | 2002 | fa27 | bfe0 | ec27 | bfe8 | ee27 | bfec | 1080 | 0031 | ea27 | bfe4 | 80a2 | 3cfd | 3680 | 002b | 9410 | 2035 | d206 | a008 |
| 3163460 | 80a2 | 7afd | 2480 | 001a | f406 | a004 | b806 | a00c | ba10 | 2000 | d64f | 001d | 8090 | 000b | 2280 | 000e | e206 | a008 | da06 | a008 | 9a20 | 000d | 9a23 | 6303 |

```
3163540 80a7 400d 3680 0008 e206 a008 ba07 6001 d64f 001d 8090 000b 32bf fff8 da06 a008 e206 a008 a220 0011 a224 6303 80a7 4011
3163620 3680 0010 9410 2035 f406 a004 8090 001a 3280 0003 ba10 2001 ba10 2000 2d3f fc00 ac15 a001 2f20 0000 aa10 2002 fa27 bfe0
3163700 ec27 bfe8 ee27 bfec 1080 0005 ea27 bfe4 9210 001a 7fff fdfd 9007 bfe0 2100 054a c024 2238 f206 4000 1500 054a f222 a234
3163760 9207 bff8 4000 0741 9007 bfe0 e004 2238 e026 c000 d107 bffc d807 bff8 d826 0000 da26 2004 81c7 e008 81e8 0000 9de3 bf78
3164040 d006 a004 8090 0008 2280 0003 ba10 2000 ba10 2001 d60f bff4 bb2f 6007 962a e080 9612 c01d d62f bff4 d006 8000 80a2 2005
3164120 1880 002a 912a 2002 1300 0534 9212 60fc d002 0009 81c2 0000 0100 0000 0014 d114 0014 d188 0014 d188 0014 d130 0014 d14c
3164200 0014 d168 da17 bff4 1f3f ffe0 9a0b 400f ba10 2000 b410 2000 1080 006c da37 bff4 e017 bff4 233f ffe0 a034 0011 ba10 2000
3164260 b410 2000 1080 0065 e037 bff4 e417 bff4 273f ffe0 a434 8013 ba10 3fff b410 3fff 1080 005e e437 bff4 e817 bff4 2b3f ffe0
3164340 a835 0015 2d0f ffff b410 3fff e837 bff4 1080 0056 ba05 a3ff d006 a008 1300 000c 9212 602a 80a2 0009 2480 0010 de06 a008
3164420 f406 a004 8090 001a 3280 0003 ba10 2001 ba10 2000 1900 03ff 9913 23ff 1b20 0000 9610 2002 fa27 bfdc d827 bfe4 da27 bfe8
3164500 1080 0037 d627 bfe0 213f fff3 a014 23d6 80a3 c010 3680 002f 9410 2040 e206 a008 a004 3e00 80a4 4010 2480 001d f406 a004
3164560 b806 a00c ba10 2000 ea4f 001d ae10 0009 8090 0015 2280 000e d606 a008 d006 a008 9020 0008 9022 0017 80a7 4008 3680 0008
3164640 d606 a008 ba07 6001 ea4f 001d 8090 0015 32bf fff8 d006 a008 d606 a008 1b00 000c 9a13 602a 9620 000b 9622 c00d 80a7 400b
3164720 3680 0010 9410 2340 f406 a004 8090 001a 3280 0003 ba10 2001 ba10 2000 253f fc00 a414 a001 2720 0000 a210 2002 fa27 bfdc
3165000 e427 bfe4 e627 bfed 1080 0005 e227 bfe0 9210 001a 7fff fd6d 9007 bfdc 2100 054a c024 2238 f206 4000 2d00 054a f225 a234
3165060 9210 0018 4000 0771 9007 bfdc e004 2238 1080 0006 e026 c000 d207 bff4 d226 0000 fa26 2004 f426 2008 81c7 e008 81e8 0000
3165140 91e3 bfc0 b72e e018 b73e e018 80a6 e030 3290 0013 d406 8000 8090 001c 3280 0010 d406 8000 c026 8000 d406 6210 8090 000a
3165220 3480 0007 9a06 600c 9610 2030 d62e 600c 9810 2001 d826 6210 9a06 600c f206 6210 c02b 4019 81c7 e008 81e8 0000 9412 a001
3165300 d426 8000 d006 0000 80a2 2003 1880 0036 912a 2002 1300 0534 9212 6378 d002 0009 81c2 0000 0100 0000 0014 d388 0014 d42c
3165360 0014 d3fc 0014 d414 80a6 e035 26bf ffe4 d406 6210 80a6 e035 3480 0028 f606 6210 8090 001c 3280 0025 f606 6210 d806 6210
3165440 8090 000c 24bf ffda d406 6210 e806 6210 9a06 600c a825 2001 e84b 4014 aa10 2001 a8a5 2030 3c80 0005 a80d 0015 a820 0014
3165520 a80d 4014 a820 0014 8090 0014 3280 0013 f606 6210 10bf ffca d406 6210 ec06 6004 8090 0016 2280 000d f606 6210 10bf ffc4
3165600 d406 6210 ee06 6004 8090 0017 3280 0007 f606 6210 10bf ffbe d406 6210 10bf ffbc d406 6210 f606 6210 b406 600c b626 e001
3165660 b406 801b d64e 8000 80a2 e039 1280 000d 8090 001b 2680 000b 8090 001b 9a10 2030 da2e 8000 b406 600c b626 e001 b406 801b
3165740 d64e 8000 80a2 e039 02bf fff7 8090 001b 2680 0006 a210 2031 de4e 8000 9e03 e001 10bf ffaa de2e 8000 e22e 600c f006 2004
3166020 80a6 2001 3280 0006 ea06 6210 e606 6008 a604 e001 10bf ffa1 e626 6008 8090 0015 2480 0007 d006 6210 ee06 6210 ba10 2030
3166100 ac06 600c fa2d 8017 d006 6210 9002 2001 10bf ff96 d026 6210 033f fff3 8200 6330 9de3 8001 f227 a048 f427 a04c d406 0000
3166160 d606 2004 9007 bfed d422 2000 d406 2008 d622 2004 d606 200c d422 2008 d406 2010 d622 200c f006 2014 d422 2010 f022 2014
3166240 ea07 bff0 aaa5 603f 3c80 0007 e207 bff4 9220 0015 4000 075d 9007 bfe8 aa10 2000 e207 bff4 d807 bff8 d407 bff8 1b00 003f
3166320 9a13 63ff a134 6010 a20c 4C04 980b 000d 9532 a010 b807 bfd8 b000 001c d427 bfe0 d827 bfe4 e227 bfdc e027 bfd8 d006 0000
3166400 ba10 2000 8090 0008 3280 0009 213f fff3 b006 2004 d006 0000 ba07 6001 8090 0008 22bf fffd b006 2004 213f fff3 a014 2398
3166460 a807 8010 912f 6002 d002 001c 4000 0a71 9210 0014 a004 2004 d027 8010 e007 8010 8090 0010 3280 0003 b410 2001 b410 2000
3166540 ae07 6001 ad2d e002 80a5 e003 b32e a002 1480 0023 ac05 801c d905 8000 b006 a001 253f fff3 9210 0018 a414 a394 d827 8012
3166620 9407 8012 4000 0a9b 9010 0014 e407 8012 ba10 0018 b006 6004 8090 0012 0280 0010 b806 0014 213f fff3 9210 001c a014 2394
3166700 4000 0a50 d007 8010 d027 8010 e007 8010 b210 0018 8090 0010 b410 001d b807 2004 b006 2004 12bf fff4 ba07 6001 ae05 e001
3166760 80a5 e003 04bf ffe1 ac05 a004 80a5 6010 ac10 2000 b32e a002 0680 0028 ae00 0014 253f fff3 a414 a394 9226 8016 9202 6001
3167040 c027 8012 9407 8012 4000 0a76 9010 0017 e407 8012 b006 6004 8090 0012 ba06 a001 0280 0010 b806 0014 233f fff3 9210 001c
3167120 a214 6394 4000 0a2b d007 8011 d027 8011 e207 8011 b210 0018 8090 0011 b410 001d b807 2004 b006 2004 12bf fff4 ba07 6001
3167200 e205 c000 aa25 6010 8090 0011 3280 0005 80a5 6010 ae05 e004 ac05 a001 80a5 6010 36bf ffdd 253f fff3 8090 0015 2480 002b
3167260 1b3f fff3 b010 0016 113f fff3 9012 2394 80a6 001a bb2d a002 c027 8008 1480 000f ba07 4014 213f fff3 a014 2394 d607 8010
3167340 d007 4000 9210 001d 912a 0015 4000 0a05 9002 000b b006 2001 80a6 001a ba07 6004 04bf fff5 d027 8010 113f fff3 9012 2394
3167420 d007 8008 bb2e 2002 8090 0008 0280 000e ba07 4014 213f fff3 9210 001d a014 2394 4000 09f4 d007 8010 d027 8010 e007 8010
3167500 b410 0018 8090 0010 ba07 6004 12bf fff6 b006 2001 1b3f fff3 9a13 6390 b807 800d 912e a002 d002 0014 4000 09d4 9210 001c
3167560 b010 2000 e24e 001c 80a4 6030 3280 0008 e607 a048 b006 2001 e24e 001c 80a4 6030 22bf fffe b006 2001 e607 a048 80a6 2003
3167640 1480 0008 ba10 2000 d24e 001c b006 2001 80a6 2003 d22c c01d 04bf fffc ba07 6001 b026 a001 b92e 2002 8090 0018 0680 0009
3167720 b827 0014 d007 0000 4000 09b8 9204 c01d b0a6 2001 b827 2004 1cbf fffb ba07 6004 e407 a04c fa24 8000 c02c c01d 81c7 e008
3170000 81e8 0000 033f fff3 8200 6340 91e3 8001 f227 a048 f427 a04c f827 a054 fa27 a058 a410 001c c024 8000 d006 2004 a810 0019
3170060 8090 0008 1280 001a a610 001a b010 2000 80a6 0013 3880 0009 80a6 0014 9410 2030 d42e c018 b006 2001 80a6 0013 28bf fffd
3170140 9410 2030 80a6 0014 3880 0009 da07 a058 9810 2030 d82e c018 b006 2001 80a6 0014 28bf fffd 9810 2030 da07 a058 f023 4000
3170220 de07 a05c 1080 00dd c023 c000 d406 0000 d606 2004 9007 bfe8 d422 2000 d406 2008 d622 2004 d606 200c d422 2008 d406 2010
3170300 d622 200c f006 2014 d422 2010 f022 2014 da07 bff0 9210 3fff 9222 400d 920a 600f b010 3fff b026 000d 8090 0009 0480 0004
3170360 b13e 2004 4000 064d 9007 bfe8 d207 bff4 1b3f fff3 9a13 63a8 a007 800d 9332 6010 912e 2002 d222 0010 da07 bff4 2300 003f
3170440 a214 63ff 9606 2001 972a e002 9a0b 4011 da22 c010 d607 bff8 9206 2002 932a 6002 9732 e010 d622 4010 d007 bff8 9a06 2003
3170520 ba06 2004 9b2b 6002 900a 0011 d023 4010 da07 bffc 992f 6002 aa10 001d bb2f 6002 9b33 6010 da23 0010 ba07 4010 d407 4000
3170600 8090 000a 3280 0009 b210 2000 ba27 6004 d407 4000 aa25 6001 8090 000a 22bf fffd ba27 6004 b210 2000 8090 0019 bb2e 2002
```

```
3170660 a32d 6002 1700 003f ac10 2000 ae10 2000 ba07 4010 a204 4010 1280 0045 b402 e3ff 8090 0014 3280 0006 393f fff3 80a5 8013
3170740 3a80 0040 80a6 4014 393f fff3 b817 23a4 9225 4018 9202 6001 9220 0009 c027 801c 9407 801c 4000 094a 9010 0011 f807 801c
3171020 9090 001c 2280 0012 173f fff3 8090 0018 0480 000f 173f fff3 9612 e3a4 da07 800b ba27 6004 900b 401a d027 4000 9b33 6010
3171100 da27 800b d607 800b b026 2001 8090 000b 12bf fff4 8090 0018 173f fff3 9612 e3a4 d807 800b ac05 a004 8090 000c 3280 0006
3171160 9010 000b da04 8000 9a03 6004 1080 0015 da24 8000 d207 8008 80a2 63e8 2a80 0004 d407 8008 1080 000b b210 2004 80a2 a064
3171240 2a80 0004 d807 9008 1080 0006 b210 2003 80a3 200a 2a80 0003 b210 2001 b210 2002 d007 8008 4000 08fd 9206 c017 ae05 e004
3171320 8090 0019 22bf ffc0 8090 0014 80a6 4014 bb2e 2002 1100 003f ba07 4010 0a80 0005 b402 23ff 80a5 8013 3a80 002c ba10 0018
3171400 253f fff3 a414 a3a4 9225 4018 9202 6001 9220 0009 c027 8012 9407 8012 4000 0904 9010 0011 e407 8012 8090 0012 2280 0012
3171460 1b3f fff3 8090 0018 0480 000f 1b3f fff3 9a13 63a4 d007 800d ba27 6004 940a 001a d427 4000 9132 2010 d027 800d da07 800d
3171540 b026 2001 8090 000d 32bf fff4 8090 0018 1b3f fff3 9206 c017 9a13 63a4 4000 08cf d007 800d b206 6004 80a6 4014 ac05 a004
3171620 0abf ffdc ae05 e004 80a5 8013 2abf ffda 253f fff3 ba10 0018 c02e c017 de07 a058 b12e 2002 b006 0010 ee23 c000 d406 0000
3171700 8090 000a 1280 000a 80a7 4015 3480 0008 80a7 4015 b006 2004 d406 0000 ba07 6001 8090 000a 02bf fffa 80a7 4015 3480 0006
3171760 da07 a05c d607 a05c 9810 2001 1080 0003 d822 c000 c023 4000 81c7 e008 81e8 0000 033f fffa 8200 6218 9de3 8001 f427 a04c
3172040 f627 a050 c027 bffc d006 0000 ae10 001a d025 e004 d206 2004 ac10 2030 d225 c000 d406 2004 80a2 a002 2280 0007 d806 6008
3172120 d606 2004 80a2 e001 1280 028f 0100 0000 d806 6008 e807 a050 80a3 2200 3680 000b e005 0000 da06 6004 80a3 6001 3280 000a
3172200 d006 0000 de06 6008 80a3 e001 3680 0006 d006 0000 e005 0000 a014 2008 1080 027e e025 0000 d206 2004 a407 bfe4 d024 a000
3172260 d006 2008 d224 a004 d206 200c d024 a008 d006 2010 d224 a00c f006 2014 d024 a010 f024 a014 9607 bfe4 d802 c000 da02 e004
3172340 9407 bfcc d822 a000 d802 e008 da22 a004 da02 e00c d822 a008 d802 e010 da22 a00c d602 e014 d822 a010 d622 a014 de07 bfec
3172420 8090 000f 3680 0004 80a3 e020 1080 002a c027 bfe8 3680 0016 80a3 e03f 80a3 e01f 3280 0004 da07 bfd8 1080 000c c027 bfd8
3172500 a410 201f a424 800f de07 bff0 9210 2001 932a 4012 9222 6001 9a0b 4009 9e2b c009 de27 bff0 da27 bfd8 9007 bfcc 4000 0578
3172560 c027 bff4 1080 0015 de07 bfe8 3680 0012 c027 bfd0 da07 bff4 d807 bfdc a210 203f a224 400f 9010 2001 912a 0011 9022 2001
3172640 980b 0008 9a2b 4008 da27 bff4 9007 bfcc d827 bfdc 4000 0566 c027 bfd8 1080 0003 de07 bfe8 de07 bfe8 8090 000f 2280 000b
3172720 253f fffb 153f fffb 9412 a088 9207 800a 9402 bffc 9407 800a 7fff fd9c 9007 bfe4 1080 0005 e606 6004 a414 a084 c027 8012
3173000 e606 6004 b610 2000 8090 0013 3280 0007 d206 6004 d006 6008 8090 0008 3680 000f de06 6004 d206 6004 80a2 6001 3280 0033
3173060 d606 6004 153f fffb 9412 a084 d407 800a d806 6008 9803 2001 80a3 000a 2480 002b d606 6004 de06 6004 80a3 e001 3280 000e
3173140 fa06 6008 213f fffb a014 2084 e007 8010 f006 6008 b006 2001 b026 0010 80a6 2200 0880 0003 0100 0000 b010 2200 1080 0008
3173220 ba10 2001 b010 2000 ba07 6001 80a7 6200 2880 0004 2b3f fffa ba10 2200 2b3f fffa aa15 6284 9a07 bffc da23 a05c 9a05 7ff8
3173300 9805 7ffc 9807 800c 9a07 800d 9607 8015 9410 001d 9210 0018 7fff fe4b 9007 bfcc a405 7ff8 e407 8012 b605 7ffc f607 801b
3173360 b606 c012 d606 6004 80a2 e001 3280 00de d006 6008 193f fffb 9813 2084 f407 800c de06 6008 80a6 800f 2480 0004 b010 2000
3173440 f406 6008 b010 2000 80a6 001a ba03 2004 b805 e00c 1680 0008 ba07 801d e64e 001d e62f 0018 b006 2001 80a6 001a 26bf fffd
3173520 e64e 001d d006 6008 80a6 0008 3280 0047 f406 6008 113f fffb 9012 2084 f025 e210 d207 8008 9222 4018 d225 e008 d807 8008
3173600 80a6 000c 3680 0022 da07 bfd0 ec4e 001d b006 2001 e04e 001d 80a4 2030 3280 000e 113f fffb 253f fffb a414 a084 e407 8012
3173660 80a6 0012 3680 0008 113f fffb b006 2001 e04e 001d 80a4 2030 22bf fff8 253f fffb 113f fffb 9012 2084 d007 8008 80a6 0008
3173740 2280 0005 d607 bfd0 9410 2001 d427 bffc d607 bfd0 8090 000b 2280 0098 d807 bffc 9810 2001 1080 0094 d827 bffc 8090 000d
3174020 2280 0092 d807 bffc e207 bffc ba02 3e00 ec4f 801d 8090 0011 3280 008c d807 bffc ba07 801d b010 2000 d04e 001d 80a2 2030
3174100 1280 0009 80a6 001b 3680 0007 80a6 001b b006 2001 d04e 001d 80a2 2030 02bf fffb 80a6 001b 3680 007d d807 bffc 9410 2001
3174160 1080 0079 d427 bffc 9090 0018 1280 0017 b426 8018 1b3f fffa 9a13 6284 aa07 800d ba10 2000 e04f 4015 80a4 2030 3280 0008
3174240 153f fffa ba07 6001 e04f 4015 80a4 2030 22bf fffe ba07 6001 153f fffa 9412 a280 e407 800a d407 800a b407 401a ba07 400a
3174320 1080 0003 b406 8012 ba10 2000 80a6 801b 2480 0004 1f3f fffa b410 001b 1f3f fffa 9a20 001a da25 e008 9e13 e280 e007 800f
3174400 80a4 001a 3680 0003 b610 001a f607 800f 80a7 401b 3680 0009 113f fffa ba07 6001 a610 2030 e62f 0018 80a7 401b 06bf fffc
3174460 b006 2001 113f fffa 9012 2284 90a7 401a 1680 000c b607 8008 153f fffa 9412 a280 d407 800a 9427 400a d44a 801b ba07 6001
3174540 80a7 401a d42f 0018 06bf fff8 b006 2001 113f fffa 9012 2280 de07 8008 9002 3ffc d007 8008 ba27 400f 80a7 4008 3680 0027
3174620 e406 6008 8090 001d 3680 0003 ec4f 401b ac10 2030 d207 bffc ba07 6001 8090 0009 3280 0029 f025 e210 8090 001d 3680 0004
3174700 d44f 401b ba10 2000 d44f 401b 80a2 a030 3280 000e 1f3f fffa 193f fffa 9813 227c d807 800c 80a7 400c 3680 0008 1f3f fffa
3174760 ba07 6001 d44f 401b 80a2 a030 22bf fff8 193f fffa 1f3f fffa 9e13 e27c de07 800f 80a7 400f 3680 0010 f025 e210 a210 2001
3175040 1080 000c e227 bffc 80a6 0012 3680 000a f025 e210 a610 2030 e62f 0018 e406 6008 b006 2001 80a6 0012 26bf fffc a610 2030
3175120 f025 e210 d807 bffc 9410 0014 9010 0019 9210 0017 7fff fbff 9610 0016 1080 010a 0100 0000 8090 0008 2680 0085 fa06 6008
3175200 133f fffb 9212 6084 d407 8009 d606 6008 9402 800b 80a2 a200 36bf fe80 e005 0000 ba02 6004 d207 8009 b010 2000 80a6 0009
3175260 b805 e00c 1680 000b ba07 801d e64e 001d 233f fffb e62f 0018 a214 6084 e207 8011 b006 2001 80a6 0011 26bf fffa e64e 001d
3175340 d006 6008 b410 001b 80a6 c008 2480 0004 133f fffa f406 6008 133f fffa 9212 6280 d407 8009 80a2 801a 3680 0003 b610 001a
3175420 f607 8009 ba10 2000 80a7 401b 3680 0009 1f3f fffa ba07 6001 9a10 2030 da2f 0018 80a7 401b 06bf fffc b006 2001 1f3f fffa
3175500 9e13 e284 90a7 401a 1680 000c b607 800f 233f fffa a214 6280 e207 8011 a227 4011 e24c 401b ba07 6001 80a7 401a e22f 0018
3175560 06bf fff8 b006 2001 d206 6008 80a7 4009 3680 000a 113f fffb 9410 2030 d42f 0018 d206 6008 ba07 6001 80a7 4009 06bf fffb
3175640 b006 2001 113f fffb 9012 2084 f025 e210 d607 8008 9622 c018 b002 3dfc d625 e008 f007 8018 9002 3df8 d007 8008 b027 4018
3175720 80a6 0008 3680 0027 d807 bffc 8090 0018 3680 0003 ec4e 001b ac10 2030 d207 bffc b006 2001 8090 0009 3280 001e d807 bffc
```

| | | | | | | | | | | | | | | | | | | | | | | | | |
|---|---|---|---|---|---|---|---|---|---|---|---|---|---|---|---|---|---|---|---|---|---|---|---|---|
| 3176000 | 8090 | 0018 | 3680 | 0004 | d44e | 001b | b010 | 2000 | d44e | 001b | 80a2 | a030 | 3280 | 000e | 1f3f | fffa | 193f | fffa | 9813 | 227c | d807 | 800c | 80a6 | 000c |
| 3176060 | 3680 | 0008 | 1f3f | fffa | b006 | 2001 | d44e | 001b | 80a2 | a030 | 22bf | fff8 | 193f | fffa | 1f3f | fffa | 9e13 | e27c | de07 | 800f | 80a6 | 000f | 3680 | 0005 |
| 3176140 | d807 | bffc | a210 | 2001 | e227 | bffc | d807 | bffc | 9410 | 0014 | 9010 | 0019 | 9210 | 0017 | 7fff | fb79 | 9610 | 0016 | 1080 | 0084 | 0100 | 0000 | 113f | fffb |
| 3176220 | 9012 | 2084 | d207 | 8008 | ba20 | 001d | 80a2 | 6200 | 36bf | fdfe | e005 | 0000 | 80a7 | 6200 | 36bf | fdfb | e005 | 0000 | 9410 | 0008 | d607 | 800a | 80a2 | c01d |
| 3176300 | 3480 | 0026 | b802 | a004 | 9810 | 0008 | da07 | 800c | 80a3 | 401d | 3280 | 0006 | b010 | 2000 | ac03 | 2004 | ec4f | 8016 | 1080 | 0003 | b010 | 2001 | ac10 | 2030 |
| 3176360 | b803 | 2004 | b807 | 801c | e64e | 001c | 80a4 | e030 | 3280 | 000e | 173f | fffb | 133f | fffb | 9212 | 6084 | d207 | 8009 | 80a6 | 0009 | 3680 | 0008 | 173f | fffb |
| 3176440 | b006 | 2001 | e64e | 001c | 80a4 | e030 | 22bf | fff8 | 133f | fffb | 173f | fffb | 9612 | e084 | d607 | 800b | 80a6 | 000b | 1680 | 0003 | 9a10 | 2001 | da27 | bffc |
| 3176520 | 1080 | 0033 | c025 | e210 | d407 | 800a | b010 | 2000 | 9422 | 801d | 80a6 | 000a | b605 | e00c | 1680 | 000c | b807 | 801c | d24e | 001c | 253f | fffb | d22e | c018 |
| 3176600 | a414 | a084 | e407 | 8012 | b006 | 2001 | a424 | 801d | 80a6 | 0012 | 26bf | fff9 | d24e | 001c | 153f | fffb | 9412 | a084 | f025 | e210 | d407 | 800a | 80a6 | 000a |
| 3176660 | 3680 | 001c | d207 | bfd0 | ec4e | 001c | b006 | 2001 | da4e | 001c | 80a3 | 6030 | 3280 | 000e | 253f | fffb | 213f | fffb | a014 | 2084 | e007 | 8010 | 80a6 | 0010 |
| 3176740 | 3680 | 0008 | 253f | fffb | b006 | 2001 | da4e | 001c | 80a3 | 6030 | 22bf | fff8 | 213f | fffb | 253f | fffb | a414 | a084 | e407 | 8012 | 80a6 | 0012 | 3680 | 0005 |
| 3177020 | d207 | bfd0 | 9010 | 2001 | d027 | bffc | d207 | bfd0 | 8090 | 0009 | 2280 | 0005 | d807 | bffc | 9410 | 2001 | d427 | bffc | d807 | bffc | 9010 | 0019 | 9410 | 0014 |
| 3177100 | 9210 | 0017 | 7fff | fb07 | 9610 | 0016 | f005 | e210 | d805 | e210 | b205 | e00c | 9803 | 001d | 80a6 | 000c | 3680 | 000b | c025 | e008 | 9e10 | 2030 | de2e | 4018 |
| 3177160 | d805 | e210 | b006 | 2001 | 9803 | 001d | 80a6 | 000c | 26bf | fffb | 9e10 | 2030 | c025 | e008 | f025 | e210 | c02e | 4018 | 81c7 | e008 | 81e8 | 0000 | 9de3 | bf80 |
| 3177240 | c106 | 0000 | c306 | 2004 | c13f | bff8 | 100f | bff8 | 9132 | 2007 | 900a | 2001 | d026 | a004 | 4000 | 036e | 9010 | 0018 | d026 | 8000 | d006 | 8000 | 80a2 | 2005 |
| 3177320 | 1880 | 0015 | 912a | 2002 | 1300 | 0539 | 9212 | 637c | d002 | 0009 | 81c2 | 0000 | 0100 | 0000 | 0014 | e794 | 0014 | e7b4 | 0014 | e7d4 | 0014 | e79c | 0014 | e7a4 |
| 3177400 | 0014 | e7ac | 1080 | 0010 | 0100 | 0000 | 1080 | 000e | 0100 | 0000 | 1080 | 000c | 0100 | 0000 | 1080 | 000a | 0100 | 0000 | 9207 | bff8 | 4000 | 03af | 9007 | bfe0 |
| 3177460 | 9007 | bfe0 | 9210 | 0019 | 9410 | 001a | 7fff | fd35 | 9610 | 001b | 81c7 | e008 | 81e8 | 0000 | 0000 | 1500 | 054a | d402 | a234 | 80a2 | a003 | 1880 | 0013 |
| 3177540 | 952a | a002 | 1300 | 053a | 9212 | 6008 | d402 | 8009 | 81c2 | 8000 | 0100 | 0000 | 0014 | e818 | 0014 | e820 | 0014 | e828 | 0014 | e838 | 1080 | 0008 | 9010 | 2001 |
| 3177620 | 1080 | 0006 | 9010 | 2000 | 8090 | 0008 | 3280 | 0003 | 9010 | 2000 | 9010 | 2001 | 81c3 | e008 | 0100 | 0000 | 9de3 | bfa0 | d006 | 2014 | 8090 | 0008 | 0280 | 0056 |
| 3177700 | 0100 | 0000 | 4000 | 0325 | 9010 | 2000 | 1100 | 054a | d002 | 2234 | 80a2 | 2003 | 1880 | 002c | 912a | 2002 | 1300 | 053a | 9212 | 6084 | d002 | 0009 | 81c2 | 0000 |
| 3177760 | 0100 | 0000 | 0014 | e894 | 0014 | e8b4 | 0014 | e8bc | 0014 | e8ec | d206 | 2014 | 1520 | 0000 | 80a2 | 400a | 2a80 | 0003 | 9610 | 2000 | 9610 | 2001 | 1080 | 001b |
| 3200040 | ba10 | 000b | 1080 | 0019 | ba10 | 2000 | d806 | 2014 | 8090 | 000c | 2280 | 0003 | 9a10 | 2000 | 9a10 | 2001 | de06 | 0000 | 8090 | 000f | 3280 | 0003 | a010 | 2000 |
| 3200120 | a010 | 2001 | 1080 | 000d | ba0c | 000d | e406 | 2014 | 8090 | 0012 | 2280 | 0003 | a610 | 2000 | a610 | 2001 | e806 | 0000 | 8090 | 0014 | 2280 | 0003 | aa10 | 2000 |
| 3200200 | aa10 | 2001 | ba0d | 4013 | 8090 | 001d | 2280 | 0016 | 1900 | 054a | ee06 | 2010 | ae05 | e001 | ee26 | 2010 | f406 | 2010 | 8090 | 001a | 3280 | 000f | 1900 | 054a |
| 3200260 | f606 | 200c | b606 | e001 | f626 | 200c | d006 | 200c | 8090 | 0008 | 3280 | 0008 | 1900 | 054a | d206 | 2008 | 1720 | 0000 | 9202 | 6001 | d226 | 2008 | d626 | 200c |
| 3200340 | 1900 | 054a | d803 | 2234 | 8090 | 000c | 1280 | 000a | 0100 | 0000 | da06 | 2014 | 1f20 | 0000 | 80a3 | 400f | 1280 | 0005 | 0100 | 0000 | e006 | 2010 | a00c | 3ffe |
| 3200420 | e026 | 2010 | 81c7 | e008 | 81e8 | 0000 | 9de3 | bfa0 | d006 | 2004 | 80a2 | 2004 | 1980 | 0040 | 912a | 2002 | 1300 | 053a | 9212 | 61d4 | d002 | 0009 | 81c2 | 0000 |
| 3200500 | 0100 | 0000 | 0014 | e9e8 | 0014 | eab8 | 0014 | e9f0 | 0014 | ea8c | 0014 | ea8c | 1080 | 0034 | c026 | 4000 | d006 | 2008 | 80a2 | 2020 | 3680 | 0026 | f006 | 0000 |
| 3200560 | d406 | 2008 | 9210 | 203f | 9222 | 400a | 4000 | 022b | 9010 | 0018 | 7fff | ff8b | 9010 | 0018 | d606 | 200c | 8090 | 000b | 3280 | 001b | f006 | 0000 | d806 | 2010 |
| 3200640 | 1b20 | 0000 | 80a3 | 000d | 2a80 | 000c | e406 | 2010 | de06 | 0000 | 8090 | 000f | 2280 | 0012 | f006 | 0000 | e006 | 2010 | 2320 | 0000 | 80a4 | 0011 | 3880 | 000d |
| 3200720 | f006 | 0000 | e406 | 2010 | e426 | 4000 | f006 | 0000 | 8090 | 0018 | 0280 | 0011 | 0100 | 0000 | ea06 | 4000 | aa20 | 0015 | 1080 | 000d | ea26 | 4000 | f006 | 0000 |
| 3201000 | 8090 | 0018 | 2280 | 0006 | 3720 | 0000 | 351f | ffff | b416 | a3ff | 1080 | 0003 | f426 | 4000 | f626 | 4000 | 4000 | 028e | 9010 | 2004 | 81c7 | e008 | 81e8 | 0000 |
| 3201060 | 9de3 | bf98 | d206 | 0000 | d60f | bffc | 932a | 6007 | 962a | e080 | 9612 | c009 | d62f | bffc | d006 | 2004 | 80a2 | 2004 | 1880 | 00a5 | 912a | 2002 | 1300 | 053a |
| 3201140 | 9212 | 6300 | d002 | 0009 | 81c2 | 0000 | 0100 | 0000 | 0014 | eb14 | 0014 | ed78 | 0014 | ebb0 | 0014 | eb3c | 0014 | eb64 | da17 | bffc | 1f00 | 001f | 9e13 | e380 |
| 3201220 | 9a2b | 400f | da37 | bffc | e007 | bffc | 233f | e000 | a00c | 0011 | 1080 | 0091 | e027 | bffc | e417 | bffc | 2700 | 001f | a614 | e380 | a414 | 8013 | e437 | bffc |
| 3201300 | e807 | bffc | 2b3f | e000 | a80d | 0015 | 1080 | 0087 | e827 | bffc | ec17 | bffc | 2f00 | 001f | ae15 | e380 | ac15 | 8017 | ec37 | bffc | f006 | 200c | d807 | bffc |
| 3201360 | 3900 | 0fff | b817 | 23ff | b136 | 2008 | b00e | 001c | 173f | e000 | 1100 | 1000 | b016 | 0008 | b02e | 000b | 980b | 000b | 9813 | 0018 | 1080 | 0074 | d827 | bffc |
| 3201440 | 9210 | 2028 | 4000 | 01c1 | 9010 | 0018 | da06 | 2008 | 9a03 | 607f | da26 | 2008 | e006 | 2008 | 8090 | 0010 | 1480 | 9032 | 0100 | 0000 | e217 | bffc | 2500 | 001f |
| 3201520 | a414 | a380 | a22c | 4012 | e237 | bffc | e606 | 2008 | 9210 | 2001 | 9222 | 4013 | 4000 | 01b0 | 9010 | 0018 | 7fff | ff10 | 9010 | 0018 | e806 | 2010 | 2b00 | 2000 |
| 3201600 | 80a5 | 0015 | 3280 | 0010 | 1100 | 054a | f617 | bffc | ac10 | 2001 | ad2d | a007 | b62e | c012 | b616 | c016 | f637 | bffc | f807 | bffc | 3b3f | e000 | b80f | 001d |
| 3201660 | f827 | bffc | 4000 | 0229 | 9010 | 2002 | 1380 | 004c | e807 | bffc | d002 | 2238 | 808a | 2001 | 2280 | 0005 | f006 | 2010 | 4000 | 0221 | 9010 | 2002 | f006 | 2010 |
| 3201740 | de07 | bffc | 1500 | 1fff | 9412 | a3ff | 1b3f | e000 | b00e | 000a | b02e | 000d | 9e0b | c00d | 9e13 | c018 | 1080 | 003a | de27 | bffc | 7fff | feea | 9010 | 0018 |
| 3202020 | e006 | 2010 | 2300 | 4000 | 80a4 | 0011 | 3280 | 0008 | ea06 | 2008 | 2500 | 2000 | e426 | 2010 | e606 | 2008 | a604 | e001 | e626 | 2008 | ea06 | 2008 | 80a5 | 60ff |
| 3202100 | 2680 | 0018 | d206 | 2008 | 4000 | 0204 | 9010 | 2003 | 4000 | 0202 | 9010 | 2000 | 7fff | febe | d006 | 0000 | 8090 | 0008 | 32bf | ff93 | e417 | bffc | f617 | bffc |
| 3202160 | 3500 | 001f | b416 | a380 | ac10 | 20fe | ad2d | a007 | b62e | c01a | b616 | c016 | f637 | bffc | f807 | bffc | 3b3f | e000 | b937 | 001d | 1080 | 0014 | f827 | bffc |
| 3202240 | d817 | bffc | 1700 | 001f | 9612 | e380 | 932a | 6007 | 920a | 400b | 982b | 000b | 9813 | 0009 | d837 | bffc | f006 | 2010 | e607 | bffc | 1f00 | 1fff | 9e13 | e3ff |
| 3202320 | 253f | e000 | b00e | 000f | b02e | 0012 | a60c | c012 | a614 | c018 | e627 | bffc | e807 | bffc | e826 | 4000 | 81c7 | e008 | 81e8 | 0000 | 9de3 | bf98 | d206 | 0000 |
| 3202400 | d60f | bff8 | 932a | 6007 | 962a | e080 | 9612 | c009 | d62f | bff8 | d006 | 2004 | 80a2 | 2004 | 1880 | 00b1 | 912a | 2002 | 1300 | 053b | 9212 | 61c8 | d002 | 0009 |
| 3202460 | 81c2 | 0000 | 0100 | 0000 | 0014 | eddc | 0014 | f070 | 0014 | ee88 | 0014 | ee08 | 0014 | ee34 | da17 | bff8 | 1f00 | 001f | 9e13 | e3f0 | 9a2b | 400f | da37 | bff8 |
| 3202540 | e007 | bff8 | 233f | fc00 | a00c | 0011 | c027 | bffc | 1080 | 009c | e027 | bff8 | e417 | bff8 | 2700 | 001f | a614 | e3f0 | a414 | 8013 | e437 | bff8 | e807 | bff8 |
| 3202620 | 2b3f | fc00 | a80d | 0015 | c027 | bffc | 1080 | 0091 | e827 | bff8 | ec17 | bff8 | 2f00 | 001f | ae15 | e3f0 | ac15 | 8017 | ec37 | bff8 | 9210 | 200b | 4000 | 011b |
| 3202700 | 9010 | 0018 | f406 | 200c | d607 | bff8 | 3700 | 01ff | b616 | e3ff | b40e | 801b | 153f | fc00 | 3b00 | 0200 | b416 | 801d | b42e | 800a | 960a | c00a | 9612 | c01a |
| 3202760 | 1080 | 007a | d627 | bff8 | 9210 | 200b | 4000 | 010b | 9010 | 0018 | da06 | 2008 | 9a03 | 63ff | da26 | 2008 | e006 | 2008 | 8090 | 0010 | 1480 | 0036 | 0100 | 0000 |
| 3203040 | e217 | bff8 | 2500 | 001f | a414 | a3f0 | a22c | 4012 | e237 | bff8 | e606 | 2008 | 9210 | 2001 | 9222 | 4013 | 4000 | 00fa | 9010 | 0018 | 7fff | fe5a | 9010 | 0018 |

```
3203120  e806 200c 2b00 0400 80a5 0015 3280 0011 1100 054a f617 bff8 ac10 2001 ad2d a004 b62e c012 b616 c016 f637 bff8 f807 bff8
3203200  3b3f fc00 b80f 001d f827 bff8 9010 2002 4000 0172 c027 bffc 1080 0053 f807 bffc d002 2238 808a 2001 2280 0005 d217 bff8
3203260  4000 016a 9010 2002 d217 bff8 1900 03ff 922a 4012 d237 bff8 d606 200c e207 bff8 9813 23ff 213f fc00 960a c00c 962a c010
3203340  a20c 4010 a214 400b 1080 003c e227 bff8 7fff fe30 9010 0018 e606 200c 2900 0800 80a4 c014 3280 0008 f406 2008 2b00 0400
3203420  ea26 200c ec06 2008 ac05 a001 ec26 2008 f406 2008 80a6 a7ff 2680 001a da06 2008 4000 014a 9010 2003 4000 0148 9010 2000
3203500  7fff fe04 d006 0000 8090 0008 32bf ff8c e417 bff8 d017 bff8 3b00 001f ba17 63f0 b610 27fe b72e e004 902a 001d 9012 001b
3203560  d037 bff8 d207 bff8 153f fc00 9232 400a 9610 3fff d227 bff8 1080 0016 d627 bffc e217 bff8 2100 001f a014 23f0 9b2b 6004
3203640  9a0b 4010 a22c 4010 a214 400d e237 bff8 e406 200c ee07 bff8 2700 03ff a614 e3ff 2d3f fc00 a40c 8013 a42c 8016 ae0d c016
3203720  ae15 c012 ee27 bff8 f006 2019 f027 bffc f807 bffc f607 bff8 f626 4000 f826 6004 81c7 e008 81e8 0000 9de3 bf88 d206 0000
3204000  d60f bff4 932a 6007 962a e080 9612 c009 d62f bff4 d006 2004 80a2 2004 1880 007d 912a 2002 1300 053c 9212 60c8 d002 0009
3204060  81c2 0000 0100 0000 0014 f0dc 0014 f2a0 0014 f140 0014 f0f8 0014 f114 da17 bff4 1f3f ffe0 9a0b 400f ba10 2000 b010 2000
3204140  1080 006c da37 bff4 e017 bff4 233f ffe0 a034 0011 ba10 2000 b010 2000 1080 0065 e037 bff4 e417 bff4 273f ffe0 a434 8013
3204220  e437 bff4 fa06 200c 2b1f ffff aa15 63ff ba0f 4015 2f10 0000 1080 0059 ba17 4017 1100 054a d002 2230 80a2 2001 0280 0006
3204300  80a2 2002 2280 000c 9010 0018 1080 0010 f606 2008 9010 0018 7fff fe56 9207 bff0 9207 bff0 4000 020c 9010 0018 1080 0008
3204360  f606 2008 7fff ff01 9207 bfe8 9207 bfe8 4000 0139 9010 0019 f606 2008 3900 000f b817 23ff b606 c01c f626 2008 d206 2008
3204440  8090 0009 1480 0019 0100 0000 d417 bff4 173f ffe0 940a 800b d437 bff4 d806 2008 9210 2001 9222 400c 4000 0038 9010 0018
3204520  7fff fd98 9010 0018 1b00 054a da03 6238 808b 6001 2280 0005 de17 bff4 4000 00bb 9010 2002 de17 bff4 213f ffe0 9e0b c010
3204600  1080 0022 de37 bff4 7fff fd8a 9010 0018 e206 2008 2500 001f a414 a3ff 80a4 4012 2680 0014 d017 bff4 4000 00ac 9010 2003
3204660  4000 00aa 9010 2000 7fff fd66 d006 0000 8090 0008 32bf ffaa e017 bff4 ec17 bff4 2b1f ffe0 ac0d 8015 a404 bfff ac15 8012
3204740  ba10 3fff b010 3fff 1080 000a ec37 bff4 f406 2008 393f ffe0 b42e 801c 900a 001c 9012 001a d037 bff4 fa06 200c f006 2010
3205020  d207 bff4 d226 4000 fa26 6004 f026 6008 81c7 e008 81e8 0000 9de3 bfc0 80a6 6042 2680 000f 80a6 6020 d006 200c d206 2010
3205100  d606 2014 9012 c009 8092 000b 3280 0004 1908 0000 1080 003c c026 2004 d826 2014 c026 2010 1080 0038 c026 200c 2680 0012
3205160  8090 0019 da06 2014 8090 000d 2280 0006 e206 2010 de06 2010 9e13 e001 de26 2010 e206 2010 b226 6020 e226 2014 e406 200c
3205240  80a6 6020 e426 2010 16bf fff3 c026 200c 8090 0019 2720 0000 0480 0023 ba10 0013 e806 2014 808d 2001 2280 0006 ee06 2014
3205320  ea06 2014 aa15 6002 ea26 2014 ee06 2014 af35 e001 ee26 2014 f606 2010 808e e001 2280 0006 d206 2010 f806 2014 b817 001d
3205400  f826 2014 d206 2010 9332 6001 d226 2010 d606 200c 808a e001 2280 0006 de06 200c d806 2010 9813 001d d826 2010 de06 200c
3205460  b226 6001 8090 0019 9f33 e001 14bf ffe1 de26 200c 81c7 e008 81e8 0000 9de3 bfc0 d006 2004 80a2 2002 1280 003e 0100 0000
3205540  d206 200c d406 2010 d806 2014 9212 400a 8092 400c 3280 0004 da06 200c 1080 0035 c026 2004 8090 000d 3280 000f e806 200c
3205620  de06 2010 de26 200c e006 2014 e026 2010 c026 2014 e206 2008 a224 6020 e226 2008 da06 200c 8090 000d 22bf fff7 de06 2010
3205700  e806 200c 2720 0000 ba10 0013 80a5 001d 1a80 0020 0100 0000 ea06 200c ab2d 6001 ea26 200c ee06 2010 80a5 c01d 2a80 0006
3205760  f606 2010 f206 200c b206 6001 f226 200c f606 2010 b72e e001 f626 2010 d006 2014 80a2 001d 2a80 0006 d606 2014 d206 2010
3206040  9202 6001 d226 2010 d606 2014 972a e001 d626 2014 da06 2008 9a23 6001 da26 2008 e806 200c 80a5 001d 2abf ffe5 ea06 200c
3206120  81c7 e008 81e8 0000 9210 2001 912a 4008 1300 054a d602 6238 9612 c008 81c3 e008 d622 6238 9de3 bfb8 c106 0000 c306 2004
3206200  c13f bff8 d017 bff8 9132 2004 900a 27ff 8090 0008 3280 000f e417 bff8 d807 bff8 1b00 03ff 9a13 63ff 980b 000d 8090 000c
3206260  1280 0006 0100 0000 e207 bffc 8090 0011 2280 001b b010 2000 1080 0019 b010 2001 a534 a004 a40c a7ff 80a4 a7ff 3280 0014
3206340  b010 2002 ec07 bff8 2f00 03ff ae15 e3ff b20d 8017 8090 0019 3280 0008 1500 0100 f607 bffc 8090 001b 3280 0004 1500 0100
3206420  1080 0007 b010 2003 ac0d 8017 80a5 800a 3a80 0003 b010 2004 b010 2005 81c7 e008 81e8 0000 9de3 bfc0 80a6 6020 2a80 000b
3206500  8090 0019 d006 2010 b226 6020 d026 200c d206 2014 80a6 6020 d226 2010 1abf fffa c026 2014 8090 0019 1520 0000 0280 001c
3206560  ba10 000a d606 200c 972a e001 d626 200c da06 2010 808b 401d 2280 0006 e206 2010 de06 200c 9e13 e001 de26 200c e206 2010
3206640  a32c 6001 e226 2010 e606 2014 808c c01d 2280 0006 ec06 2014 e806 2010 a815 2001 e826 2010 ec06 2014 b226 6001 8090 0019
3206720  ad2d a001 12bf ffe8 ec26 2014 81c7 e008 81e8 0000 9de3 bf98 c106 4000 c306 6004 c13f bff8 d00f bff8 9132 2007 900a 2001
3207000  d026 0000 da07 bffc da26 2010 c026 2014 de17 bff8 9f33 e004 9e0b e7ff 8090 000f 3280 0019 d417 bff8 e607 bff8 2900 03ff
3207060  a815 23ff a60c c014 8090 0013 3280 0008 b410 2002 ee07 bffc 8090 0017 3280 0004 b410 2002 1080 003f c026 2004 f426 2004
3207140  b610 3c0d f626 2008 f807 bff8 9010 0018 b80f 0014 7fff ff36 f826 200c 1080 0035 0100 0000 9532 a004 940a a7ff 80a2 a7ff
3207220  3280 0020 e417 bff8 de07 bff8 2100 03ff a014 23ff a20b c010 8090 0011 3280 0009 3700 0200 e607 bffc 8090 0013 3280 0005
3207300  3700 0200 a810 2003 1080 0022 e826 2004 9e0b c010 808b c01b 2280 0005 ba10 2004 b810 2004 1080 0005 f826 2004 fa26 2004
3207360  7fff ff5a 9010 2004 d607 bff8 1900 0200 960a c010 9612 c00c 1080 000f d626 200c aa10 2002 a534 a004 a40c a7ff a424 a3ff
3207440  e426 2008 ea26 2004 f607 bff8 2f00 03ff ae15 e3ff b60e c017 3900 0400 b616 c01c f626 200c 9210 200b 7fff ff7b 9010 0018
3207520  81c7 e008 81e8 0000 9de3 bfb8 f006 0000 f027 bffc d217 bffc 9332 6007 920a 60ff 8090 0009 3280 000b e417 bffc da07 bffc
3207600  1f00 1fff 9e13 e3ff 9a0b 400f 8090 000d 2280 0018 b010 2000 1080 0016 b010 2001 a534 a007 a40c a0ff 80a4 a0ff 3280 0011
3207660  b010 2002 ec07 bffc 2f00 1fff ae15 e3ff ac0d 8017 8090 0016 3280 0004 f607 bffc 1080 0008 b010 2003 1300 1000 b60e c017
3207740  80a6 c009 3a80 0003 b010 2004 b010 2005 81c7 e008 81e8 0000 9de3 bfb0 d006 0000 1500 001f d027 bff4 d217 bff4 fa06 2004
3210020  f806 2008 9412 a3ff 920a 400a 8090 0009 3280 0009 da17 bff4 8090 001d 1280 0004 8090 001c 2280 0017 b010 2000 1080 0015
3210100  b010 2001 9a0b 400a 80a3 400a 3280 0011 b010 2002 271f ffff a614 e3ff b00f 4013 8090 0018 3280 0007 2b10 0000 8090 001c
3210160  3280 0004 2b10 0000 1080 0006 b010 2003 90a6 0015 3a80 0003 b010 2004 b010 2005 81c7 e008 81e8 0000 9de3 bfa0 d006 4000
```

```
3210240  8090 0008 3280 0005 d206 4000 c026 0000 1080 0017 c026 2004 8090 0009 3680 0003 9410 2000 9410 2001 9610 2002 d426 0000
3210320  d626 2004 9810 231f d826 2008 da06 4000 8090 000d 2680 0004 f206 4000 1080 0003 f206 4000 b220 0019 f226 200c c026 2010
3210400  c026 2014 7fff fe92 9010 0018 81c7 e008 81e8 0000 9de3 bf98 f206 4000 f227 bffc d20f bffc 9332 6007 920a 6001 d226 0000
3210460  c026 2010 c026 2014 de17 bffc 9f33 e007 9e0b e0ff 8090 000f 3280 0016 d417 bffc e607 bffc 2900 1fff a815 23ff a60c c014
3210540  8090 0013 3280 0004 ae10 2002 1080 003c c026 2004 ee26 2004 b410 3f81 f426 2008 d007 bffc 900a 0014 912a 2009 d026 200c
3210620  7fff fe6f 9010 0018 1080 0031 0100 0000 9532 a007 940a a0ff 80a2 a0ff 3280 001e e417 bffc de07 bffc 2100 1fff a014 23ff
3210700  9e0b c010 8090 000f 3280 0005 e807 bffc a610 2003 1080 0022 e626 2004 3500 1000 a80d 0010 808d 001a 2280 0005 b810 2004
3210760  b610 2004 1080 0005 f626 2004 f826 2004 7fff fe96 9010 2004 d407 bffc 1910 0000 940a 8010 952a a008 9412 800c 1080 0010
3211040  d426 200c aa10 2002 a534 a007 a40c a0ff a424 a07f e426 2008 ea26 2004 f607 bffc 2f00 1fff ae15 e3ff b60e c017 b72e e008
3211120  3b20 0000 b616 c01d f626 200c 81c7 e008 81e8 0000 9de3 bf90 d006 4000 9e10 2002 d027 bff4 d20f bff4 fa06 6004 f206 6008
3211200  3332 6007 920a 6001 d226 0000 de26 2004 e617 bff4 2300 001f a214 63ff 2900 000f a815 23ff a60c c011 a624 c014 e626 2008
3211260  fa26 200c f226 2010 c026 2014 ee17 bff4 ae0d c011 80a5 c011 3280 0018 1f20 0000 131f ffff 9212 63ff 808f 4009 3280 0008
3211340  1710 0000 8090 0019 3280 0005 1710 0000 9410 2003 1080 001a d426 2004 808f 400b 2280 0005 9a10 2004 9810 2004 1080 0014
3211420  d826 2004 da26 2004 7fff fe50 9010 2004 1080 000f 0100 0000 80a7 400f 1a80 000c 8090 001d 3280 0007 a010 2002 8090 0019
3211500  3280 0004 a010 2002 1080 0005 c026 2004 e026 2004 7fff fdfe 9010 0018 81c7 e008 81e8 0000 0000 0000 9de3 bf88 111f ffff
3211560  9012 23ff 9410 2042 d437 bffc d027 bfec 9010 0019 9407 bfec f427 a04c f627 a050 f827 a054 fa27 a058 f027 bff0 f027 bff4
3211640  4000 0152 9207 a04c d807 bff0 c02b 0000 81c7 e008 81e8 0000 9de3 bfa0 f227 a048 f427 a04c f627 a050 f827 a054 fa27 a058
3211720  1500 01d1 d402 a030 9207 a048 4000 000d 9010 0018 81c7 e008 91e8 0008 0000 0000 9de3 bfa0 9010 2000 9210 0018 9410 2000
3212000  4000 000e 9610 2000 81c7 e008 91e8 0008 8210 203b 91d0 2000 1a80 0004 1b00 0345 9a13 61c0 81c3 4000 0100 0000 81c3 e008
3212060  0100 0000 0000 0000 821c 2007 91d0 2000 1a80 0004 1b00 0345 9a13 61c0 81c3 4000 0100 0000 81c3 e008 0100 0000 0000 0000
3212140  8210 2042 91d0 2000 1a80 c004 1b00 0345 9a13 61c0 81c3 4000 0100 0000 8090 0009 3280 0002 9010 0000 81c3 e008 0100 0000
3212220  8210 2001 91d0 2000 8182 0000 98aa 200f 0280 0034 1b3f ffc0 98aa 20ff 2280 0040 9923 0009 98aa 2fff 2280 004f 9923 0009
3212300  988a 000d 2280 0062 9923 0009 9888 0000 9923 0009 9923 0009 9923 0009 9923 0009 9923 0009 9923 0009 9923 0009 9923 0009
3212360  9923 0009 9923 0009 9923 0009 9923 0009 9923 0009 9923 0009 9923 0009 9923 0009 9923 0009 9923 0009 9923 0009 9923 0009
*
3212520  9923 0000 8090 0009 1680 0003 0100 0000 9803 0008 9140 0000 81c3 e008 9283 0000 9923 0009 9923 0009 9923 0009 9923 0009
3212600  9923 0000 9b40 0000 8090 0009 1680 0003 933b 201c 9202 4008 912b 2004 9b33 601c 9013 4008 81c3 e008 8090 0009 9923 0009
3212660  9923 0009 9923 0009 9923 0009 9923 0009 9923 0009 9923 0009 9923 0000 9b40 0000 8090 0009 1680 0003 933b 2018 9202 4008
3212740  912b 2008 9b33 6018 9013 4008 81c3 e008 8090 0009 9923 0009 9923 0009 9923 0009 9923 0009 9923 0009 9923 0009 9923 0009
3213020  9923 0009 9923 0009 9923 0009 9923 0009 9923 0000 9b40 0000 8090 0009 1680 0003 933b 2014 9202 4008 912b 200c 9b33 6014
3213100  9013 4008 81c3 e008 8090 0009 9923 0009 9923 0009 9923 0009 9923 0009 9923 0009 9923 0009 9923 0009 9923 0009 9923 0009
3213160  9923 0009 9923 0009 9923 0009 9923 0009 9923 0009 9923 0009 9923 0000 9b40 0000 8090 0009 1680 0003 933b 2010 9202 4008
3213240  912b 2010 9b33 6010 9013 4008 81c3 e008 8090 0009 0000 0000 9de3 bfa0 ba10 2003 9210 200a 7fff e95d 9010 0018 9002 2030
3213320  d02e 401d 9010 0018 7ffe 882a 9210 200a ba27 6001 bb2f 6010 bb3f 6010 80a7 7fff 12bf fff4 b010 0008 81c7 e008 81e8 0000
3213400  9de3 bfa0 2100 0009 9204 2310 7fff e94b 9010 0018 d026 4000 9010 0018 7ffe 8819 9204 2310 81c7 e008 91e8 0008 9de3 bfa0
3213460  fa06 8000 b32e 6010 b33e 6010 b910 0019 8090 001c 2480 0018 b220 001c b226 6001 b32e 6010 1900 0009 1700 003f b802 e3ff
3213540  b603 2310 b33e 6010 d006 0000 7fff ff4b 9210 001b ba02 001d b226 6001 b32e 6010 9e0f 401c b33e 6010 80a6 7fff de26 0000
3213620  bb37 6010 0280 0018 b006 2004 10bf fff4 9006 0000 b226 6001 b32e 6010 2d00 0009 2b00 003f b805 63ff b605 a310 b33e 6010
3213700  d006 0000 7fff ff35 9210 001b ba02 001d b226 6001 b32e 6010 900f 401c b33e 6010 80a6 7fff d026 0000 bb37 6010 12bf fff5
3213760  b026 2004 fa26 8000 81c7 e008 81e8 0000 9de3 bfa0 fa06 8000 b32e 6010 b33e 6010 b810 0019 8090 001c 2480 001a b220 001c
3214040  b226 6001 b32e 6010 1700 0009 b802 e310 b33e 6010 d806 0000 9210 001c 992b 2010 ba13 001d 7fff e8fd 9010 001d d026 0000
3214120  9010 001d 7ffe 87cb 9210 001c b226 6001 b32e 6010 b33e 6010 80a6 7fff b006 2004 0280 001a ba10 0008 10bf fff0 d806 0000
3214200  b226 6001 b32e 6010 2900 0009 b805 2310 b33e 6010 ea06 0000 9210 001c ab21 6010 ba15 401d 7fff e8e5 9010 001d d026 0000
3214260  9010 001d 7ffe 87b3 9210 001c b226 6001 b32e 6010 b33e 6010 80a6 7fff b026 2004 12bf fff1 ba10 0008 fa26 8000 81c7 e008
3214340  81e8 0000 c000 0000 9de3 b738 f227 a048 fa4e 0000 ae06 2001 b610 001d 8090 001b 0280 001f 0100 0000 d656 a010 960a e012
3214420  80a2 e002 1280 0013 0100 0000 da06 a008 8090 000d 0280 000f 0100 0000 de06 a004 d006 a008 80a3 c008 3280 0013 f006 a004
3214500  d206 8000 8090 0009 3280 000f f006 a004 d456 a010 808a a084 3280 000b f006 a004 4000 05fc 9010 001a 8090 c008 2280 0006
3214560  f006 a004 1080 04e0 b410 3fff 1090 04de b410 2000 f806 8000 e207 a048 1f00 0545 9e13 e1ac 9007 bc01 1b00 0545 191f ffff
3214640  9813 23ff 9a13 6198 d027 b7b4 de27 b7b8 1f00 0292 1100 0545 da27 b7bc d827 b7cc 9807 bbf6 9a07 b7d8 9012 2190 9e13 e131
3214720  9607 b7d3 9407 b7d5 9207 b7d4 d227 b7c8 d427 b7c4 d627 b7c0 de27 b7a8 d027 b7a4 da27 b7ac d827 b7b0 b210 2000 80a6 e025
3215000  2280 00e3 ba10 0017 b8a7 2001 3c80 0012 ba0f 60ff d256 a010 808a 6084 2280 0008 9010 001a d806 a00c 9620 001c 80a2 c00c
3215060  2680 0009 ba0f 60ff 9010 001a 4000 059b f026 a004 f006 a004 f806 8000 b827 2001 ba0f 60ff fa2e 0000 b206 6001 1080 0487
3215140  b006 2001 1080 03ca ba1c 3c17 1080 00c8 ba10 0017 a204 6004 fa04 7ffc 8090 001d 3280 0004 f64f 4000 fa07 b7a4 f64f 4000
3215220  ba07 6001 8090 001b 2280 0479 fa4d c000 b8a7 2001 3c80 0012 b60e e0ff d256 a010 808a 6084 2280 0008 9010 001a d806 a00c
3215300  9620 001c 80a2 c00c 2680 0009 b60e e0ff 9010 001a 4000 0575 f026 a004 f006 a004 f806 8000 b827 2001 b60e e0ff f62e 0000
```

```
3215360 b206 6001 10bf ffe6 b006 2001 a204 6004 fa04 7ffc bb2f 6018 bb3f 6018 b8a7 2001 3c80 0012 ba0f 60ff d656 a010 808a e084
3215440 2280 0008 9010 001a de06 a00c 9a20 001c 80a3 400f 2680 0009 ba0f 60ff 9010 001a 4000 055a f026 a004 f006 a004 f806 8000
3215520 b827 2001 ba0f 60ff fa2e 0000 b206 6001 1080 0446 b006 2001 a204 6004 f604 7ffc 8090 001b 3680 001d ea07 b7bc b8a7 2001
3215600 3c80 0012 9810 202d de56 a010 808b e084 2280 0008 901c 001a d406 a00c 9220 001c 80a2 400a 2680 0009 9810 202d 9010 001a
3215660 4000 053e f026 a004 f006 a004 f806 8000 b827 2001 9810 202d d82e 0000 b206 6001 b620 001b 1080 0004 b006 2001 a204 6004
3215740 f604 7ffc ea07 b7bc fa07 b7b4 9210 200a 7fff e812 9010 001b d04d 4008 ba27 6001 d02f 4000 9010 001b 7ffe 86de 9210 200a
3216020 b610 0008 8090 001b 2280 0039 d407 b7b4 10bf fff4 9210 200a fa07 b7b4 a204 6004 f604 7ffc 8090 001b 0280 004c 0100 0000
3216100 8090 001b 2280 002e d407 b7b4 d807 b7b8 9410 200f 940e c00a d84b 000a ba27 6001 b736 e004 10bf fff7 d82f 4000 fa07 b7b4
3216160 a204 6004 f604 7ffc 8090 001b 0280 003b 0100 0000 8090 001b 2280 001d d407 b7b4 d407 b7bc 9010 200f 900e c008 d44a 8008
3216240 ba27 6001 b736 e004 10bf fff7 d42f 4000 fa07 b7b4 a204 6004 f604 7ffc 8090 001b 0280 002a 0100 0000 8090 001b 2280 000c
3216320 d407 b7b4 d007 b7bc 9a10 2007 9a0e c00d d04a 000d b736 e003 8090 001b ba27 6001 12bf fff9 d02f 4000 d407 b7b4 80a7 400a
3216400 3a80 03df fa4d c000 f64f 4000 b8a7 2001 1c80 0011 ba07 6001 d656 a010 808a e084 2280 0008 9010 001a de06 a00c 9a20 001c
3216460 80a3 400f 2680 0009 b60e e0ff 9010 001a 4000 04da f026 a004 f006 a004 f806 8000 b827 2001 b60e e0ff f62e 0000 b206 6001
3216540 10bf ffe6 b006 2001 10bf ff69 ba10 2030 ae25 e002 a810 2000 c02f bbf5 c02f bbf4 c02f bbf3 1080 004e c02f bbf2 fa4f 4000
3216620 1500 0541 9027 6044 80a2 2034 18bf fff5 ae05 e001 9332 2004 912a 6001 9202 4008 9810 200f 920a 400c 992a 6003 9412 a294
3216700 d603 000a 80a2 c008 2280 000c 9303 000a 80a2 ffff 22bf ffe8 ae25 e002 9893 2008 980b 2078 d603 000a 80a2 c008 32bf fffa
3216760 80a2 ffff 9803 000a d003 2004 81c2 0000 0100 0000 0000 0000 0015 03f8 0000 001f 0015 038c ffff ffff 0015 0600 0000 0011
3217040 0015 046c 0000 0020 0015 03f8 0000 002f 0015 0304 0000 0014 0015 04b8 0000 0031 0015 046c 0000 0024 0015 02fc 0000 0025
3217120 0015 03f8 0000 0034 0015 04fc 0000 000b 0015 0540 0000 0028 0015 02f4 ffff ffff 0015 0600 ffff ffff 0015 0600 0000 002b
3217200 0015 0540 1080 000f ae05 e001 1080 000c a810 2001 9a10 2001 1080 0009 da2f bbf5 9e10 2001 1080 0006 de2f bbf4 9010 2001
3217260 1080 0003 d02f bbf3 d22f bbf2 ae05 e001 d04d c000 80a2 2020 02bf fff6 80a2 2023 02bf fff7 80a2 202b 02bf ffed 80a2 202d
3217340 02bf ffed 80a2 2030 22bf fff4 9210 2001 144d c000 80a2 a02a 3280 000d d807 b7a8 a204 6004 de04 7ffc 8090 000f 1680 0006
3217420 de27 bbec 9210 2001 9e20 000f de27 bbec d22f bbf5 1080 0017 ae05 e001 c027 bbec d64d c000 d64a c00c 808a e004 2280 0012
3217500 de4d c000 d607 bbec d24d c000 972a e001 992a e002 9602 c00c d807 b7a8 9222 6030 9602 c009 d627 bbec ae05 e001 d64d c000
3217560 d64a c00c 808a e004 32bf fff4 d607 bbec de4d c000 80a3 e02e 3280 0019 ac10 3fff ae05 e001 d24d c000 80a2 602a 3280 0006
3217640 ac10 2000 a204 6004 ec04 7ffc 1080 0010 ae05 e001 da07 b7a8 d84d c000 d84b 000d 808b 2004 2280 000b 1100 0545 d44d c000
3217720 a12d a001 9b2d a002 ac05 800d 9422 a030 ae05 e001 10bf fff4 ac05 800a 1100 0545 a402 21c0 a610 2000 aa10 2000 a010 0012
3220000 ba10 0017 fa4f 400c 1500 0542 fa2f bbea d04f bbea ae05 e001 80a2 2078 3880 0232 b607 bbea 9332 2005 972a 6002 9202 400b
3220060 9202 4008 9810 201f 920a 400c 992a 6003 9412 a118 d603 000a 80a2 c008 2280 000c 9803 000a 80a2 ffff 2280 0223 b607 bbea
3220140 9803 2008 980b 20f8 d603 000a 80a2 c008 32bf fffa 80a2 ffff 9803 000a d003 2004 81c2 0000 0100 0000 0000 0000 0015 1168
3220220 ffff ffff 0015 1170 0000 0058 0015 0a40 0000 0073 0015 10e8 0000 0075 0015 0a28 ffff ffff 0015 1170 ffff ffff 0015 1170
3220300 0000 0078 0015 0a40 ffff ffff 0015 1170 ffff ffff 0015 1170 ffff ffff 0015 1170 ffff ffff 0015 1170 ffff ffff 0015 1170
3220360 ffff ffff 0015 1170 0000 0044 0015 0a28 0000 0045 0015 0c30 ffff ffff 0015 1170 0000 0047 0015 0fb4 0000 0063 0015 10d0
3220440 0000 0064 0015 0a28 0000 0065 0015 0c30 0000 0066 0015 0df4 0000 0067 0015 0fb4 0000 0068 0015 0a20 0000 0069 0015 0a28
3220520 0000 004f 0015 0a34 ffff ffff 0015 1170 0000 006c 0015 0a18 ffff ffff 0015 1170 ffff ffff 0015 1170 0000 006f 0015 0a34
3220600 0000 0055 0015 0a28 10bf ff9f ba10 0017 10bf ff9d ba10 0017 9210 200a 1080 0007 d22f bbeb 9410 2008 1080 0004 d42f bbeb
3220660 9610 2010 d62f bbeb 8090 0016 3680 0004 d84f bbea ac10 2001 d84f bbea a204 6004 fa04 7ffc 80a3 2064 2280 000b 8090 001d
3220740 de4f bbea 80a3 e044 2280 0007 8090 001d d24f bbea 80a2 6069 3280 0014 d44f bbf2 8090 001d 3680 0006 8090 0014 1900 0545
3221020 ba20 001d 1080 000c a403 21c1 2280 0005 d04f bbf4 1f00 0545 1080 0007 a403 e1c3 8090 0008 2280 0005 d44f bbf2 1300 0545
3221100 a402 61c5 d44f bbf2 8090 000a 2280 000b da4f bbea 4000 044b 9010 0012 d607 bbec 9622 c008 80a2 c016 2480 0004 da4f bbea
3221160 ac10 000b da4f bbea 80a3 6059 3280 0003 e607 b7bc e607 b7b8 d04f bbeb f607 b7b4 80a2 2008 0280 0012 80a2 2010 2280 001a
3221240 8090 001d 8090 001d 2280 0022 de4f bbf3 9210 200a 7fff e661 9010 001d d04c c008 b626 e001 d02e c000 9010 001d 7ffe 852d
3221320 9210 200a 10bf fff4 ba10 0008 8090 001d 2280 0014 de4f bbf3 9210 2007 920f 4009 d24c c009 b626 e001 bb37 6003 10bf fff8
3221400 d22e c000 2280 000b de4f bbf3 9a10 200f 9a0f 400d da4c c00d bb37 6004 8090 001d b626 e001 12bf fffa da2e c000 de4f bbf3
3221460 fa07 b7b4 8090 000f a626 c01d 0280 016b a604 c016 80a6 c01d 2280 0169 8090 0015 d04f bbea 80a2 2058 0280 000f 80a2 206f
3221540 0280 0006 80a2 2078 2280 0009 1300 0545 1080 015f 8090 0015 80a4 e001 3680 015c 8090 0015 1080 0159 a610 2001 1080 0157
3221620 a402 61c7 1500 0545 1080 0154 a402 a1ca 8090 0016 3680 0004 a204 6008 ac10 2006 a204 6008 c104 7ff8 c304 7ffc c13f bbe0
3221700 d007 bbe0 d207 bbe4 da07 b7ac 9807 bbd8 9405 a001 7fff ebd1 9607 bbdc d607 bbd8 ba10 0008 8090 000b 2280 0005 8090 0014
3221760 1900 0545 1080 000c a403 21cd 2280 0005 de4f bbf4 1b00 0545 1080 0007 a403 61cf 8090 000f 2280 0005 d24f b7d8 1100 0545
3222040 a402 21d1 d24f b7d8 80a2 6039 2480 000a d04f 4000 f607 b7ac ba06 e001 da4f 4000 8090 000d 2280 012a 8090 0015 10bf fffc
3222120 ba07 6001 ea07 b7b0 8090 0008 2280 0004 b610 2039 f64f 4000 ba07 6001 8090 0016 f62d 4000 1280 0006 b605 6001 da4f bbf3
3222200 8090 000d 2280 0006 aa10 0016 9e10 202e de2e c000 b606 e001 aa10 0016 8090 0015 2480 000e d64f b7d8 d04f 4000 8090 0008
3222260 2280 000a d64f b7d8 d44f 4000 aa25 6001 8090 0015 d42e c000 ba07 6001 14bf fff7 b606 e001 d64f b7d8 ba10 001b f607 b7b0
3222340 80a2 e030 2280 0004 ac10 2000 ec07 bbdc ac25 a001 8090 0016 3680 0004 d207 b7c0 ac20 0016 d207 b7c0 7fff fc6c 9010 0016
3222420 80a5 a064 1680 0004 c02f b7d7 1080 0003 ec07 b7c4 ec07 b7c8 d407 bbdc a025 a001 8090 000a 1480 0006 0100 0000 d64f b7d8
```

| | | | | | | | | | | | | | | | | | | | | | | | | |
|---|---|---|---|---|---|---|---|---|---|---|---|---|---|---|---|---|---|---|---|---|---|---|---|---|
| 3222500 | 80a2 | e030 | 3280 | 0003 | ac10 | 202d | ac10 | 202b | ec2c | 0000 | de4f | bbea | a024 | 2001 | 1080 | 00e3 | de2c | 0000 | 8090 | 0016 | 3680 | 0004 | a204 | 6008 |
| 3222560 | ac10 | 2006 | a204 | 6008 | c504 | 7ff8 | c704 | 7ffc | c53f | bbe0 | d007 | bbe0 | d207 | bbe4 | da07 | b7ac | 9410 | 0016 | 9807 | bbd8 | 7fff | ebad | 9607 | bbdc |
| 3222640 | b610 | c008 | d007 | bbd8 | 8090 | 0008 | 2280 | 0005 | 8090 | 0014 | 1300 | 0545 | 1080 | 000c | a402 | 61d3 | 2280 | 0005 | d64f | bbf4 | 1500 | 0545 | 1080 | 0007 |
| 3222720 | a402 | a1d5 | 8090 | 000b | 2280 | 0005 | da4f | b7d8 | 1900 | 0545 | a403 | 21d7 | da4f | b7d8 | 80a3 | 6039 | 2480 | 000a | ea07 | bbdc | f607 | b7ac | ba06 | e001 |
| 3223000 | d44f | 4000 | 8090 | 000a | 2280 | 00b9 | 8090 | 0015 | 10bf | fffc | ba07 | 6001 | fa07 | b7b0 | 8090 | 0015 | 3480 | 0008 | d24e | c000 | 9a10 | 2030 | da2f | 4000 |
| 3223060 | fa07 | b7b0 | 1080 | 000f | ba07 | 6001 | d24e | c000 | 8090 | 0009 | 3280 | 0005 | d84e | c000 | 9610 | 2030 | 1080 | 0004 | d62f | 4000 | b606 | e001 | d82f | 4000 |
| 3223140 | aa25 | 6001 | 8090 | 0015 | 12bf | fff5 | ba07 | 6001 | da4f | bbf3 | 8090 | 000d | 3280 | 0006 | 9e10 | 202e | 8090 | 0016 | 2480 | 0006 | a825 | a001 | 9e10 | 202e |
| 3223220 | de2f | 4000 | ba07 | 6001 | a825 | a001 | 8090 | 0014 | 0680 | 0013 | aa25 | 8016 | d207 | bbdc | 9202 | 6001 | 8090 | 0009 | 0480 | 0006 | d227 | bbdc | d64e | c000 |
| 3223300 | 8090 | 000b | 3280 | 0005 | de4e | c000 | 9a10 | 2030 | 1080 | 0004 | da2f | 4000 | b606 | e001 | de2f | 4000 | a8a5 | 2001 | 1cbf | fff1 | ba07 | 6001 | d04f | bbf2 |
| 3223360 | 8090 | c008 | 0280 | 000a | 0100 | 0000 | 4000 | 0321 | 9010 | c012 | d207 | b7b0 | e607 | bbec | 9227 | 4009 | 9002 | 0009 | 9002 | 0015 | a624 | c008 | 1080 | 0073 |
| 3223440 | f607 | b7b0 | 8090 | 0016 | 3680 | 0004 | 8090 | 0016 | 1080 | 0005 | ac10 | 2006 | 3280 | 0004 | a204 | 6008 | ac10 | 2001 | a204 | 6008 | c904 | 7ff8 | cb04 | 7ffc |
| 3223520 | c93f | bbe0 | d007 | bbe0 | d207 | bbe4 | d807 | b7ac | d64f | bbf3 | 4000 | 0448 | 9410 | 0016 | d04f | b7d8 | 80a2 | 202d | 2280 | 000e | d007 | b7a8 | 8090 | 0014 |
| 3223600 | 2280 | 0005 | d64f | bbf4 | 1500 | 0545 | 1080 | 0007 | a402 | a1d9 | 8090 | 000b | 2280 | 0005 | d007 | b7a8 | 1900 | 0545 | a403 | 21db | d007 | b7a8 | de4f | bbea |
| 3223660 | f607 | b7ac | de4b | c008 | 808b | e001 | 0280 | 001b | ba10 | 001b | d64f | 4000 | 8090 | 000b | 2280 | 000c | d04f | 4000 | da4f | 4000 | 80a3 | 6065 | 2280 | 0008 |
| 3223740 | d04f | 4000 | ba07 | 6001 | d64f | 4000 | 8090 | 000b | 32bf | fffa | da4f | 4000 | 104f | 4000 | 80a2 | 2065 | 3280 | 0005 | d64f | 4000 | 9410 | 2045 | d42f | 4000 |
| 3224020 | d64f | 4000 | 8090 | 000b | 2280 | 0035 | 8090 | 0015 | 10bf | fffc | ba07 | 6001 | da4f | 4000 | 8090 | 000d | 2280 | 002f | 8090 | 0015 | 10bf | fffc | ba07 | 6001 |
| 3224100 | f607 | b7bc | a204 | 6004 | d004 | 7ffc | bac6 | e001 | 1080 | 0026 | d02f | bbf6 | 8090 | 0016 | a204 | 6004 | 1680 | 0003 | fa04 | 7ffc | ec07 | b7cc | 8090 | 001d |
| 3224160 | 3280 | 0004 | d64f | 4000 | fa07 | b7a4 | d64f | 4000 | a810 | 2000 | 8090 | 000b | 0280 | 000a | ba07 | 6001 | 80a5 | 0016 | 3680 | 0008 | da4f | bbf2 | d64f | 4000 |
| 3224240 | a805 | 2001 | 8090 | 000b | 12bf | fffa | ba07 | 6001 | da4f | bbf2 | 8090 | 000d | 2280 | 0005 | b627 | 6001 | e607 | bbec | a624 | c014 | b627 | 6001 | ba10 | 001b |
| 3224320 | 1080 | 0006 | b626 | c014 | 1080 | 00ef | f026 | a004 | b607 | bbea | ba06 | e001 | 8090 | 0015 | 3680 | 0003 | ac10 | 0015 | ac10 | 2000 | 8090 | 0013 | 3680 | 0003 |
| 3224400 | a810 | c013 | a810 | 2000 | 4000 | 029e | 9010 | 0012 | d023 | a060 | 4000 | 029b | 9010 | 0010 | da07 | bbec | de4f | bbf5 | 9a23 | 4016 | ec03 | a060 | 9023 | 4008 |
| 3224460 | 9227 | 401b | 9022 | 0009 | 9022 | 0014 | 8090 | 000f | 0280 | 0014 | ac22 | 0016 | de4c | 8000 | 8090 | 000f | 2280 | 003a | a6a4 | e001 | b8a7 | 2001 | 3c80 | 002d |
| 3224540 | d04c | 8000 | d256 | a010 | 808a | 6084 | 2280 | 0023 | 9010 | 001a | d806 | a00c | 9620 | 001c | 80a2 | c00c | 2680 | 0024 | d04c | 8000 | 1080 | 001c | 9010 | 001a |
| 3224620 | aca5 | a001 | 2c80 | 0025 | de4c | 8000 | b8a7 | 2001 | 3c80 | 0012 | 9a10 | 2020 | d056 | a010 | 808a | 2084 | 2280 | 0008 | 9010 | 001a | d606 | a00c | 9420 | 001c |
| 3224700 | 80a2 | 800b | 2680 | 0009 | 9a10 | 2020 | 9010 | 001a | 4000 | 01b6 | f026 | a004 | f006 | a004 | f806 | 8000 | b827 | 2001 | 9a10 | 2020 | da2e | 0000 | b206 | 6001 |
| 3224760 | 10bf | ffe8 | b006 | 2001 | 4000 | 01ac | f026 | a004 | f006 | a004 | f806 | 8000 | b827 | 2001 | d04c | 8000 | a404 | a001 | 900a | 20ff | d02e | 0000 | b006 | 2001 |
| 3225040 | b206 | 6001 | de4c | 8000 | 8090 | 000f | 32bf | ffcc | b8a7 | 2001 | a6a4 | e001 | 2c80 | 001b | 80a6 | c01d | b8a7 | 2001 | 3c80 | 0012 | 9010 | 2030 | d456 | a010 |
| 3225120 | d08a | a084 | 2280 | 0008 | 9010 | 001a | da06 | a00c | 9820 | 001c | 80a3 | 000d | 2680 | 0009 | 9010 | 2030 | 9010 | 001a | 4000 | 018d | f026 | a004 | f006 | a004 |
| 3225200 | f806 | 8000 | b827 | 2001 | 9010 | 2030 | d02e | 0000 | a6a4 | e001 | b206 | 6001 | 1cbf | ffea | b006 | 2001 | 80a6 | c01d | 3a80 | 001d | aaa5 | 6001 | b8a7 | 2001 |
| 3225260 | 3c80 | 0012 | d04e | c000 | d256 | a010 | 808a | 6084 | 2280 | 0008 | 9010 | 001a | d806 | a00c | 9620 | 001c | 80a2 | c00c | 2680 | 0009 | d04e | c000 | 9010 | 001a |
| 3225340 | 4000 | 0172 | f026 | a004 | f006 | a004 | f806 | 8000 | b827 | 2001 | d04e | c000 | b606 | e001 | 900a | 20ff | d02e | 0000 | 80a6 | c01d | b206 | 6001 | 0abf | ffe8 |
| 3225420 | b006 | 2001 | aaa5 | 6001 | 2c80 | 001b | d24c | 0000 | b8a7 | 2001 | 3c80 | 0012 | 9010 | 2030 | d456 | a010 | 808a | a084 | 2280 | 0008 | 9010 | 001a | da06 | a00c |
| 3225500 | 9820 | 001c | 80a3 | 000d | 2680 | 0009 | 9010 | 2030 | 9010 | 001a | 4000 | 0155 | f026 | a004 | f006 | a004 | f806 | 8000 | b827 | 2001 | 9010 | 2030 | d02e | 0000 |
| 3225560 | aaa5 | 6001 | b206 | 6001 | 1cbf | ffea | b006 | 2001 | 124c | 0000 | 8090 | 0009 | 2280 | 001e | d84f | bbf5 | b8a7 | 2001 | 3c80 | 0012 | d44c | 0000 | d656 | a010 |
| 3225640 | 808a | e084 | 2280 | 0008 | 9010 | 001a | de06 | a00c | 9a20 | 001c | 80a3 | 400f | 2680 | 0009 | d44c | 0000 | 9010 | 001a | 4000 | 0139 | f026 | a004 | f006 | a004 |
| 3225720 | f806 | 8000 | b827 | 2001 | d44c | 0000 | a004 | 2001 | 940a | a0ff | d42e | 0000 | d24c | 0000 | b206 | 6001 | 8090 | 0009 | 12bf | ffe7 | b006 | 2001 | d84f | bbf5 |
| 3226000 | 8090 | 000c | 2280 | 001e | fa4d | c000 | aca5 | a001 | 2c80 | 001b | fa4d | c000 | b8a7 | 2001 | 3c80 | 0012 | 9610 | 2020 | da56 | a010 | 808b | 6084 | 2280 | 0008 |
| 3226060 | 9010 | 001a | d206 | a00c | 9020 | 001c | 80a2 | 0009 | 2680 | 0009 | 9610 | 2020 | 9010 | 001a | 4000 | 0117 | f026 | a004 | f006 | a004 | f806 | 8000 | b827 | 2001 |
| 3226140 | 9610 | 2020 | 162e | 0000 | aca5 | a001 | b206 | 6001 | 1cbf | ffea | b006 | 2001 | fa4d | c000 | ae05 | e001 | b610 | 001d | 8090 | 001b | 32bf | fb5e | 80a6 | e025 |
| 3226220 | f026 | a004 | f826 | 8000 | da56 | a010 | 808b | 6084 | 2280 | 0011 | f456 | a010 | d056 | a010 | 808a | 2004 | 1280 | 000a | 0100 | 0000 | d406 | a008 | d006 | a008 |
| 3226300 | 9426 | 000a | 4000 | 01fb | 9210 | 200a | 9090 | 0008 | 2280 | 0005 | f456 | a010 | 4000 | 00f4 | 9010 | 001a | f456 | a010 | 808e | a020 | 2280 | 0003 | b410 | 0019 |
| 3226360 | b410 | 3fff | 81c7 | e008 | 91e8 | 001a | 0000 | 0000 | 286e | 756c | 6c29 | 0000 | 3031 | 3233 | 3435 | 3637 | 3839 | 6162 | 6364 | 6566 | 0000 | 0000 | 3031 | 3233 |
| 3226440 | 3435 | 3637 | 3839 | 4142 | 4344 | 4546 | 0000 | 0000 | 002d | 002b | 0020 | 0030 | 7800 | 3058 | 002d | 002b | 0020 | 002d | 002b | 0020 | 002b | 0020 | 0000 | 0000 |
| 3226520 | 9de3 | bfa0 | 1100 | 0545 | 4c00 | 037c | 9012 | 21f8 | 81c7 | e008 | 81e8 | 0000 | 9de3 | bfa0 | 8090 | 0018 | 0280 | 0023 | ba10 | 3fff | d056 | 2010 | 808a | 2103 |
| 3226600 | 2280 | 0014 | de56 | 2010 | d456 | 2010 | 808a | a040 | 3280 | 0010 | de56 | 2010 | d856 | 2010 | 808b | 2004 | 3280 | 0005 | ba10 | 2000 | 4000 | 0017 | 9010 | 0018 |
| 3226660 | ba10 | c008 | 7ffe | 0141 | d04e | 2012 | 8090 | 0008 | 3680 | 0004 | de56 | 2010 | ba10 | 3fff | de56 | 2010 | 808b | e008 | 2280 | 0006 | c036 | 2010 | 7ffb | 15c3 |
| 3226740 | d006 | 2008 | c026 | 2008 | c036 | 2010 | c026 | 0000 | e206 | 2008 | e226 | 2004 | c026 | 200c | 81c7 | e008 | 91e8 | 001d | 9de3 | bfa0 | d056 | 2010 | 808a | 2002 |
| 3227020 | 3280 | 0015 | d456 | 2010 | c026 | 0000 | b010 | 2000 | 81c7 | e008 | 81e8 | 0000 | 808b | 2002 | 2280 | 0012 | f056 | 2010 | de06 | 2008 | 8090 | 000f | 2280 | 000e |
| 3227100 | f056 | 2010 | e006 | 2004 | e206 | 2008 | 80a4 | 0011 | 2880 | 0009 | f056 | 2010 | 4000 | 0094 | 9010 | 0018 | d456 | 2010 | 808a | a004 | 22bf | fff0 | d856 | 2010 |
| 3227160 | f056 | 2010 | 808e | 2020 | 22bf | ffea | b010 | 2000 | 10bf | ffe8 | b010 | 3fff | 9de3 | bf98 | b00e | 20ff | d456 | 6010 | 940a | a092 | 80a2 | a082 | 3280 | 0026 |
| 3227240 | ee56 | 6010 | d806 | 6008 | da06 | 600c | e006 | 6004 | 9803 | 00cd | 80a4 | 000c | 2a80 | 0010 | e206 | 6004 | 4000 | 007a | 9010 | 0019 | ec06 | 4000 | aca5 | a001 |
| 3227320 | 0c80 | 004d | ec26 | 4000 | f406 | 6004 | 912e | 2018 | 913a | 2018 | b406 | a001 | f426 | 6004 | 900a | 20ff | 1080 | 0067 | d02e | bfff | ba10 | 0018 | a204 | 6001 |
| 3227400 | e226 | 6004 | 80a7 | 600a | 0280 | 0004 | f02c | 7fff | 1080 | 0064 | b210 | 0018 | 4000 | 0064 | 9010 | 0019 | 80a2 | 3fff | 2280 | 005f | b210 | 3fff | 1080 | 005d |
| 3227460 | b210 | 001d | ae0d | e016 | 80a5 | e006 | 3280 | 0011 | d656 | 6010 | f02f | bfff | c026 | 4000 | d04e | 6012 | 9410 | 2001 | 7ffe | 8345 | 9207 | bfff | 80a2 | 2001 |
| 3227540 | 3280 | 0004 | d056 | 6010 | 1080 | 004e | b210 | 0018 | 9012 | 2020 | d036 | 6010 | 1080 | 004a | b210 | 3fff | 960a | e012 | 80a2 | e002 | 1280 | 0013 | 0100 | 0000 |

| | | | | | | | | | | | | | | | | | | | | | | | | |
|---|---|---|---|---|---|---|---|---|---|---|---|---|---|---|---|---|---|---|---|---|---|---|---|---|
| 3227620 | da06 | 6008 | 8090 | 000d | 0280 | 000f | 0100 | 0000 | 1e06 | 6004 | e006 | 6008 | 80a3 | c010 | 3280 | 0011 | e856 | 6010 | e206 | 4000 | 8090 | 0011 | 3280 | 000d |
| 3227700 | e856 | 6010 | e456 | 6010 | 808c | a084 | 3280 | 0009 | e856 | 6010 | 4000 | 005f | 9010 | 0019 | 8090 | 0008 | 2280 | 0004 | e856 | 6010 | 1080 | 002e | b210 | 3fff |
| 3227760 | 808d | 2084 | 02bf | ffb3 | 0100 | 0000 | 10bf | ffa6 | d456 | 6010 | d456 | 6010 | 808a | a080 | 2280 | 001c | 912e | 2018 | d806 | 4000 | de06 | 600c | 9820 | 000c |
| 3230040 | 80a3 | 000f | 3680 | 0016 | 912e | 2018 | e406 | 6004 | a12e | 2018 | a13c | 2018 | a00c | 20ff | 80a4 | 200a | 0280 | 000c | e02c | 8000 | fa06 | 6004 | ba07 | 6001 |
| 3230120 | fa26 | 6004 | fa0f | 7fff | f256 | 6010 | 808e | 6020 | 2280 | 0010 | b210 | 0018 | 1080 | 000e | b210 | 3fff | d006 | 6004 | 1080 | 0004 | d00a | 0000 | 913a | 2018 |
| 3230200 | 900a | 20ff | 7fff | ff81 | 9210 | 0019 | f256 | 6010 | 808e | 6020 | 12bf | fff5 | 0100 | 0000 | b210 | 0018 | 81c7 | e008 | 91e8 | 0019 | 9de3 | bfa0 | f606 | 2008 |
| 3230260 | f806 | 2004 | f626 | 2004 | d456 | 2010 | b827 | 001b | 808a | a084 | 2280 | 0003 | fa06 | 200c | ba10 | 2000 | fa26 | 0000 | d806 | 0000 | 8090 | 000c | 3680 | 0003 |
| 3230340 | fa06 | 0000 | ba10 | 2000 | da06 | 2008 | de06 | 200c | e206 | 2004 | 9a03 | 400f | 9a23 | 4011 | 80a3 | 401d | 3680 | 0005 | 8090 | 001c | 4000 | 0084 | 9010 | 0018 |
| 3230420 | 8090 | 001c | 2480 | 000d | b010 | 2000 | 404e | 2012 | 9210 | 001b | 7ffe | 82d1 | 9410 | 001c | 80a7 | 0008 | 2280 | 0006 | b010 | 2000 | e656 | 2010 | a614 | e020 |
| 3230500 | e636 | 2010 | b010 | 3fff | 81c7 | e008 | 81e8 | 0000 | 9de3 | bfa0 | d256 | 2010 | 920a | 6012 | 80a2 | 6002 | 2280 | 000c | e456 | 2010 | d656 | 2010 | 808a | e102 |
| 3230560 | 3280 | 0004 | de56 | 2010 | 1080 | 002a | b010 | 3fff | 9e0b | ffef | 9e13 | e002 | de36 | 2010 | e456 | 2010 | 808c | a040 | 3280 | 0023 | b010 | 2000 | e806 | 2008 |
| 3230640 | 8090 | 0014 | 3280 | 0005 | ea06 | 2004 | 4000 | 001f | 9010 | 0018 | ea06 | 2004 | ec06 | 2008 | 80a5 | 4016 | 3280 | 0018 | b010 | 2000 | ee56 | 2010 | 808d | e084 |
| 3230720 | 3280 | 0014 | b010 | 2000 | f406 | 200c | f426 | 0000 | f606 | 0000 | 8090 | 001b | 3680 | 0003 | fa06 | 0000 | ba10 | 2000 | f806 | 2008 | d006 | 200c | d406 | 2004 |
| 3231000 | b807 | 0008 | b827 | c00a | 80a7 | 001d | 3680 | 0005 | b010 | 2000 | 4000 | 0041 | 9010 | 0018 | b010 | 2000 | 81c7 | e008 | 81e8 | 0000 | 9de3 | bf60 | f84e | 2012 |
| 3231060 | d456 | 2010 | 808a | a004 | 0280 | 0009 | 1b00 | 054a | 1a03 | 6228 | b92f | 2003 | 9a03 | 401c | da26 | 2008 | a010 | 2008 | 1080 | 002d | e026 | 200c | 4000 | 0085 |
| 3231140 | 9010 | 001c | 8090 | 0008 | 2280 | 0007 | 9010 | 001c | e256 | 2010 | ba10 | 2080 | a214 | 6080 | 1080 | 000c | e236 | 2010 | 4000 | 0035 | 9207 | bfc0 | 8090 | 0008 |
| 3231220 | 2680 | 0007 | ba10 | 2400 | fa07 | bff0 | 8090 | 001d | 1480 | 0003 | 0100 | 0000 | ba10 | 2400 | 7ffb | 13b8 | 9007 | 6008 | 8090 | 0008 | 0280 | 0007 | d026 | 2008 |
| 3231300 | e656 | 2010 | a614 | e008 | e636 | 2010 | 1080 | 000f | fa26 | 200c | 2100 | 054a | ec05 | a228 | b92f | 2003 | ac05 | 801c | ec26 | 2008 | b210 | 2008 | f226 | 200c |
| 3231360 | f456 | 2010 | b40e | bf7f | f436 | 2010 | d256 | 2010 | 9212 | 6004 | d236 | 2010 | d606 | 2008 | d626 | 2004 | 81c7 | e008 | 91e8 | 2000 | d402 | 2008 | d202 | 200c |
| 3231440 | da02 | 2004 | 9402 | 8009 | 9a22 | 800d | 8090 | 000d | 3680 | 0004 | d602 | 0000 | 1080 | 0006 | d422 | 2004 | 80a3 | 400b | 1680 | 0003 | 0100 | 0000 | da22 | 0000 |
| 3231520 | 81c3 | e008 | 9000 | 2000 | 8210 | 203e | 91d0 | 2000 | 1a80 | 0004 | 1b00 | 0345 | 9a13 | 61c0 | 81c3 | 4000 | 0100 | 0000 | 81c3 | e008 | 0100 | 0000 | 0000 | 0000 |
| 3231600 | 9210 | 0008 | 968a | 6003 | 0280 | 001a | 9010 | 0000 | 80a2 | e002 | 0280 | 0009 | 80a2 | e003 | d60a | 4000 | 9202 | 6001 | 0280 | 0010 | 8090 | 000b | 3280 | 0003 |
| 3231660 | 9002 | 2001 | 3080 | 001f | d612 | 4000 | 9202 | 6002 | 9932 | e008 | 8090 | 000c | 3280 | 0003 | 9002 | 2001 | 3080 | 0018 | 968a | e0ff | 3280 | 0006 | 9002 | 2001 |
| 3231740 | 3080 | 0014 | 3280 | 0003 | 9002 | 2001 | 3080 | 0011 | 171f | bfbf | 9612 | e2ff | 1920 | 4040 | 9813 | 2100 | d402 | 4000 | 9202 | 6004 | 9a02 | 800b | 9a1b | 400a |
| 3232020 | 9a0b | 400c | 80a3 | 400c | 22bf | fffa | 9002 | 2004 | 1b3f | c000 | 808a | 800d | 1280 | 0004 | 9b33 | 6008 | 81c3 | e008 | 0100 | 0000 | 808a | 800d | 1280 | 0004 |
| 3232100 | 9b33 | 6008 | 81c3 | e008 | 9002 | 2001 | 808a | 800d | 1280 | 0004 | 808a | a0ff | 81c3 | e008 | 9002 | 2002 | 32bf | ffe8 | 9002 | 2004 | 81c3 | e008 | 9002 | 2003 |
| 3232160 | 9de3 | bf88 | 1100 | 0295 | fa02 | 21c8 | 1310 | 0495 | 9212 | 6001 | 9010 | 0018 | 4000 | 01ee | 9407 | bfee | 8090 | 0008 | 3680 | 0005 | ba10 | 2001 | 1300 | 0295 |
| 3232240 | fa22 | 61c8 | ba10 | 2000 | 81c7 | e008 | 91e8 | 001d | 932a | 6018 | 933a | 6018 | 94a2 | a001 | 2c80 | 0007 | 9010 | 2000 | da4a | 0000 | 80a3 | 4009 | 12bf | fffb |
| 3232320 | 9002 | 2001 | 9022 | 2001 | 81c3 | e008 | 0100 | 0000 | 9de3 | bf98 | f427 | a04c | d006 | 6004 | ba10 | 001b | 8090 | 0008 | 2280 | 0006 | d006 | 4000 | 9210 | 202d |
| 3232400 | ba06 | e001 | d22e | c000 | d006 | 4000 | 80a2 | 2005 | 1880 | 0024 | 912a | 2002 | 1300 | 0547 | 9212 | 61bc | d002 | 0009 | 81c2 | 0000 | 0100 | 0000 | 0015 | 1dd4 |
| 3232460 | 0015 | 1e30 | 0015 | 1e30 | 0015 | 1de4 | 0015 | 1e04 | 0015 | 1e04 | 9610 | 2030 | d62f | 4000 | 1080 | 00cb | ba07 | 6001 | 80a6 | 2008 | 3680 | 0005 | 1b00 | 054a |
| 3232540 | 1900 | 054a | 1080 | 0006 | b603 | 221c | 1080 | 0004 | b603 | 6210 | 1f00 | 054a | b603 | e220 | e04e | c000 | 8090 | 0010 | 2280 | 00be | c02f | 4000 | e44e | c000 |
| 3232620 | b606 | e001 | e42f | 4000 | 10bf | fff9 | ba07 | 6001 | e606 | 6008 | f407 | a04c | 8090 | 0013 | 3480 | 0009 | ee4e | 600c | ec06 | 6008 | a806 | 2003 | a820 | 0014 |
| 3232700 | 80a5 | 8014 | 3680 | 0052 | ec06 | 6008 | ee4e | 600c | 9210 | 202e | ee2f | 4000 | ba07 | 6001 | d22f | 4000 | b806 | 600c | b610 | 2001 | b807 | 001b | da4f | 0000 |
| 3232760 | ba07 | 6001 | 8090 | 000d | 2280 | 000d | 80a6 | 2001 | f84f | 0000 | b606 | e001 | f82f | 4000 | b806 | 600c | b807 | 001b | da4f | 0000 | ba07 | 6001 | 8090 | 000d |
| 3233040 | 32bf | fff9 | f84f | 0000 | 80a6 | 2001 | 2280 | 0006 | ba27 | 6001 | 8090 | 001a | 3280 | 000d | aa10 | 2065 | ba27 | 6001 | e24f | 4000 | 80a4 | 6030 | 22bf | fffe |
| 3233120 | ba27 | 6001 | e64f | 4000 | 80a4 | e02e | 2280 | 0004 | aa10 | 2065 | ba07 | 6001 | aa10 | 2065 | ea2f | 4000 | f206 | 6008 | ba07 | 6001 | b606 | 401b | b6a6 | e001 |
| 3233200 | 2c80 | 0006 | 9810 | 202d | 9410 | 202b | d42f | 4000 | 1080 | 0005 | ba07 | 6001 | d82f | 4000 | ba07 | 6001 | b620 | 001b | 9010 | 001b | b207 | bffc | 7fff | f803 |
| 3233260 | 9210 | 0019 | b610 | 2000 | e24e | c019 | 80a4 | 6030 | 3280 | 0008 | 80a6 | e002 | b606 | e001 | e24e | c019 | 80a4 | 6030 | 22bf | fffe | b606 | e001 | 80a6 | e002 |
| 3233340 | 2480 | 0004 | 80a6 | e003 | b610 | 2002 | 80a6 | e003 | 3480 | 0063 | c02f | 4000 | e64e | c019 | b606 | e001 | e62f | 4000 | 10bf | fffa | ba07 | 6001 | a806 | 2001 |
| 3233420 | a820 | 0014 | 80a5 | 8014 | 2480 | 0023 | a410 | 2030 | ee06 | 6008 | b610 | 2000 | ae06 | 0017 | 80a6 | c017 | 3680 | 000d | 9610 | 202e | 9206 | 600c | d24a | 401b |
| 3233500 | b606 | e001 | d22f | 4000 | ee06 | 6008 | ba07 | 6001 | ae06 | 0017 | 80a6 | c017 | 26bf | fff9 | 9206 | 600c | 9610 | 202e | d62f | 4000 | 9806 | 600c | d84b | 001b |
| 3233560 | ba07 | 6001 | 8090 | 000c | 2280 | 0031 | 80a6 | 2001 | 80a6 | c018 | 3680 | 002e | 80a6 | 2001 | a006 | 600c | e04c | 001b | b606 | e001 | e02f | 4000 | 10bf | fff9 |
| 3233640 | ba07 | 6001 | e42f | 4000 | ba07 | 6001 | a810 | 202e | e82f | 4000 | ec06 | 6008 | b610 | 2000 | ac05 | 8018 | ac20 | 0016 | 80a6 | c016 | 1680 | 000b | ba07 | 6001 |
| 3233720 | 9210 | 2030 | d22f | 4000 | ec06 | 6008 | b606 | e001 | ac05 | 8018 | ac20 | 0016 | 80a6 | c016 | 06bf | fff9 | ba07 | 6001 | b806 | 600c | b610 | 2000 | b807 | 001b |
| 3234000 | d84f | 0000 | 8090 | 000c | 2280 | 000d | 80a6 | 2001 | f84f | 0000 | b606 | e001 | f82f | 4000 | b806 | 600c | b807 | 001b | d84f | 0000 | ba07 | 6001 | 8090 | 000c |
| 3234060 | 32bf | fff9 | f84f | 0000 | 80a6 | 2001 | 2280 | 0006 | ba27 | 6001 | 8090 | 001a | 3280 | 000d | c02f | 4000 | ba27 | 6001 | e04f | 4000 | 80a4 | 2030 | 22bf | fffe |
| 3234140 | ba27 | 6001 | e44f | 4000 | 80a4 | a02e | 2280 | 0004 | c02f | 4000 | ba07 | 6001 | c02f | 4000 | 81c7 | e008 | 81e8 | 0000 | 9de3 | bd78 | f027 | a044 | f227 | a048 |
| 3234220 | 1100 | 03d2 | d002 | 2370 | 9210 | 2001 | d227 | bff8 | d027 | bff4 | f427 | bffc | 9007 | a044 | 9207 | bff4 | 9407 | bde0 | 7fff | f17a | 9607 | bddc | 9207 | bde0 |
| 3234300 | 9010 | 001a | 9410 | 001b | 7fff | ff06 | 9610 | 001c | 81c7 | e008 | 91e8 | 001c | 9de3 | bfa0 | f027 | a044 | f227 | a048 | 9010 | 0018 | 9210 | 0019 | 9410 | 001a |
| 3234360 | 9610 | 2000 | 7fff | ffe4 | 9810 | 001b | 81c7 | e008 | 91e8 | 0008 | 0000 | 0000 | 9de3 | bfa0 | 1100 | 054b | d002 | 2268 | 8090 | 0008 | 3280 | 001b | 2100 | 054b |
| 3234440 | 1100 | 0294 | 9012 | 2348 | ba10 | 0008 | b802 | 2280 | 80a7 | 401c | 1a80 | 000a | 0100 | 0000 | d657 | 6010 | 808a | e103 | 0280 | 002d | 0100 | 0000 | ba07 | 6014 |
| 3234520 | 80a7 | 401c | 2abf | fffb | d657 | 6010 | 4000 | 0029 | 0100 | 0000 | 8090 | 0008 | 3280 | 0007 | 2100 | 054b | 1f00 | 0295 | 9a10 | 200c | ba10 | 2000 | 1080 | 001f |
| 3234600 | da23 | e1c8 | fa04 | 2268 | e207 | 4000 | 8090 | 0011 | 2280 | 0012 | f007 | 4000 | e407 | 4000 | e454 | a010 | 808c | a103 | 2280 | 000d | f007 | 4000 | 2b00 | 054b |
| 3234660 | ea05 | 626c | ba07 | 6004 | 80a7 | 4015 | 2abf | fff4 | e207 | 4000 | 2f00 | 0295 | ac10 | 2018 | ba10 | 2000 | 1080 | 000a | ec25 | e1c8 | 8090 | 0018 | 3280 | 0007 |

```
3234740  fa07 4000 9210 2014 7ffb 1404 9010 2001 d027 4000 fa07 4000 81c7 e008 91e8 001d 9de3 bfa0 4000 0085 0100 0000 ba10 0008
3235020  9010 001d 7ffb 13f9 9210 2004 1500 054b d022 a268 d402 a268 8090 000a 2280 0022 ba10 2000 7ffb 1116 912f 6003 1700 054a
3235100  8090 0008 1280 0008 d022 e228 2100 054b 7ffb 12a6 d004 2268 ba10 2000 1080 0016 c024 2268 1100 054b de02 2268 bb2f 6002
3235160  9e03 c01d 1300 0294 9212 6348 ba10 0009 b602 6280 2300 054b de24 626c f802 2268 80a7 401b 3a80 0008 ba10 2001 fa27 0000
3235240  ba07 6014 80a7 401b 0abf fffd b807 2004 ba10 2001 81c7 e008 91e8 001d 9de3 bfa0 1100 054b d002 2268 8090 0008 3280 0008
3235320  1300 054b 7fff ffcb 0100 0000 8090 0008 0280 0018 0100 0000 1300 054b fa02 6268 1500 054b d402 a26c 80a7 400a 3a80 0011
3235400  ba10 2000 d607 4000 8090 200b 3280 0007 1500 054b 9210 2014 7ffb 13b8 9010 2001 d027 4000 1500 054b d402 a26c ba07 6004
3235460  80a7 400a 2abf fff5 d607 4000 ba10 2000 81c7 e008 91e8 001d 9de3 bfa0 8090 0018 0280 002f 1100 054b d002 2268 8090 0008
3235540  3280 0012 1b00 054b 1100 0294 9012 2348 ba10 0008 b802 2280 80a7 401c 1a80 0024 0100 0000 d657 6010 808a e103 0280 0005
3235620  9010 001d 9210 0018 9fc0 4000 0100 0000 10bf fff6 ba07 6014 fa03 6268 1f00 054b de03 e26c 80a7 400f 1a80 0015 0100 0000
3235700  e007 4000 8090 0010 2280 000c 1f00 054b e207 4000 e254 6010 808c 6103 2280 0007 1f00 054b d007 4000 8210 0018 9fc0 4000
3235760  0100 0000 1f00 054b de03 e26c ba07 6004 80a7 400f 2abf fff0 e007 4000 81c7 e008 81e8 0000 0000 0000 8210 2059 9140 2000
3236040  1a80 0004 1b00 0345 9a13 61c0 81c3 4000 0100 0000 81c3 e008 0100 0000 0000 0000 8210 2036 91d0 2000 1a80 0004 1b00 0345
3236120  9a13 61c0 81c3 4000 0100 0000 81c3 e008 0100 0000 0000 0000 0014 9000 0014 9018 0014 9c64 0014 9ce4 0014 a4a0 0014 9198
3236200  0014 9050 0014 907c 0014 9d8c 0014 9e4c 0014 90f0 0014 a044 0014 9384 0014 9368 0014 98a4 0014 9910 0014 949c 0014 951c
3236260  0014 9980 0014 9958 0014 9bc0 0014 9c28 0014 99e4 0014 93fc 0014 9f2c 0000 0000 4028 2329 3838 2f31 312f 3032 2073 7472
3236340  696e 6773 2e63 0932 372e 3100 0000 0000 0000 0000 0000 0000 0000 0000 0000 0000 0000 0000 0000 0000 0000 0000 0000 0000
3236420  0000 0000 0000 0000 0000 0000 0000 0000 0000 0000 0000 0000 0000 0000 0000 0000 0000 0000 0000 0000 0000 0000 0000 0000
*
3240320  0000 0000 0000 0000 0000 0000 0000 0000 0000 0000 0000 0000 0000 0000 0015 2a40 0000 0000 0000 0100 0000 0000 0000 0000
3240400  256c 6400 0000 0000 0000 0000 0000 0000 2f62 696e 2f73 6800 7368 002d 6300 0000 494e 4649 4e49 5459 0000 0000 4e41 4e28
3240460  0000 0000 0000 0000 4e61 4e00 496e 6669 6e69 7479 0000 0000 4028 2329 756d 756c 7469 706c 792e 7320 312e 3820 3838 2f30
3240540  322f 3038 2043 6f70 7972 2031 3938 3720 5375 6e20 4d69 6372 6f00 0000 0000 0000 496e 6669 6e69 7479 0000 0000 496e 6600
3240620  4e61 4e00 0000 0000 0015 2d68 0000 0000 0000 0000 0000 0000 0000 0000 0000 0000 0000 0000 0000 0000 0000 0000 0000 0000
3240700  0000 0000 0000 0000 0000 0000 0000 0000 0000 0000 0000 0000 0000 0000 0000 0000 0000 0000 0000 0000 0000 0000 0000 0000
*
3243540  0000 0000 0000 0000 0000 0000 0000 0000 0000 7087 b328 0007 0014 8ca4 0000 0000 0000 6fdf b328 3001 0014 8cd0 0000 0000
3243620  0000 6fcf b328 300e 0014 8cfc 0000 0000 0000 6fd7 b328 301d 0014 8d28 0000 0000 0015 3030 0013 f404 0000 6f8f b328 7290
3243700  0014 8d54 0000 0000 000b dc64 0000 0000 0015 3048 0015 3058 0000 702f b328 35d0 0014 8d80 0000 0000 000f 4cf8 0000 0000
3243760  0015 3068 0015 3078 0000 6fef b328 3580 0014 8dac 0000 0000 000f 4ca8 0000 0000 0015 3088 0015 3098 0000 6fe7 b328 3099
3244040  0014 8dd8 0000 0000 000f 4c98 0000 0000 0015 30a8 0015 30b8 0000 700f b328 72cc 0014 8e04 0000 0000 000f 4ce8 0000 0000
3244120  0015 30c8 0015 30d8 0000 7007 b328 0ad7 0014 8e30 0000 0000 000f 4cd8 0000 0000 0015 30e8 0015 30f8 0000 7017 b328 3387
3244200  0014 8e5c 0000 0000 000f 4d18 0000 0000 0015 3108 0015 3118 0000 701f b328 2f26 0014 8e88 0000 0000 0000 6fb7 b328 0ddf
3244260  000b 32f4 0000 0000 0000 6fa7 b328 2ede 000b 3320 0000 0000 0000 7077 b328 fded 000b 334c 0000 0000 0000 7027 b328 feb5
3244340  000b 3378 0000 0000 0000 6fbf b328 0007 000b 33a4 0000 0000 0000 6fc7 b328 3175 0013 c288 0000 0000 0000 6f97 b328 0ddf
3244420  0013 c2b4 0000 0000 0000 6faf b328 0007 0013 c2e0 0000 0000 0000 7067 b328 31a9 0013 c30c 0000 0000 000f 4da8 0000 0000
3244500  0015 31b8 0015 31c8 0000 706f b328 31c5 0013 c338 0000 0000 000f 4d48 0000 0000 0015 31d8 0015 31e8 0000 7037 b328 0007
3244560  0013 c364 0000 0000 000f 4d28 0000 0000 0015 31f8 0015 3208 0000 6ff7 b328 72e8 0013 c390 0000 0000 000f 4cb8 0000 0000
3244640  0015 3218 0015 3228 0000 6fff b328 34b0 0013 c3bc 0000 0000 000f 4cc8 0000 0000 0015 3238 0015 3248 2c78 001a 0002 438a
3244720  7ae4 0000 7fc4 7c28 0014 9000 0004 88d0 228c 3259 2c78 001e 0002 438a 7ae4 0000 7fd0 8124 7ebc 0000 0014 9018 0008 88ec
3245000  228c 7318 2c78 0026 0002 438a 7ae4 0004 7ed4 813c 8130 7fc4 7ebc 0000 0014 9ce4 0010 8924 0018 885c 228c 32a1 2c78 001a
3245060  0002 438a 7ae4 0000 7ebc 0000 0014 a4a0 0000 88b4 228c 33d8 2c78 001a 0002 438a 7ae4 0000 7fc4 7c28 0014 9050 0004 88d0
3245140  228c 22cf 2c78 001a 0002 438a 7ae4 0000 8124 7c28 0014 907c 0004 881c 228c 0ddf 2c78 0024 0002 438a 7ae4 0000 7fe8 813c
3245220  8130 7fc4 7ebc 0000 0014 9d8c 0010 8924 0018 228c 2c78 0026 0002 438a 7ae4 0004 7ed4 813c 8130 7fc4 7ebc 0000 0014 9e4c
3245300  0010 8924 0018 885c 228c 2d6e 2c78 001e 0002 438a 7ae4 0000 813c 7fd0 7fc4 7c28 0014 90f0 000c 8908 228c 0007 2c78 0028
3245360  0002 438a 7ae4 0008 7ed4 7ed4 8130 7fc4 7ebc 0000 0014 a044 0010 8908 88e4 891c 0018 228c 2c78 001a 0002 438a 7ae4 0000
3245440  7fc4 7c28 0014 9384 0004 88d0 228c 0007 2c78 0018 0002 438a 7ae4 0000 7ebc 0000 0014 9368 0000 228c 2c78 0020 0002 438a
3245520  7ae4 0000 8148 813c 8130 8124 7ebc 0000 0014 98a4 0010 228c 2c78 0018 0002 438a 7ae4 0000 8124 7c28 0014 9910 0004 228c
3245600  2c78 001a 0002 438a 7ae4 0000 8124 7c28 0014 949c 0004 88d0 228c 3411 2c78 001a 0002 438a 7ae4 0000 8258 7c28 0014 951c
3245660  0008 88d0 228c 0ddf 2c78 0020 0002 438a 7ae4 0004 7ed4 8130 8124 7c28 0014 9980 000c 8908 8938 228c 2c78 001a 0002 438a
3245740  7ae4 0000 7ebc 0000 0014 9958 0000 88b4 228c ffbd 2c78 0020 0002 438a 7ae4 0004 7ed4 8124 7ebc 0000 0014 9c28 0008 88ec
3246020  88c8 228c 2c78 0028 0002 438a 7ae4 0008 7ed4 7ed4 8130 8124 7ebc 0000 0014 99e4 0010 8924 0018 88e4 8ab8 228c 2c78 001e
3246100  0002 438a 7ae4 0000 813c 8130 7fc4 7c28 0014 93fc 000c 8908 228c 0007 2c78 0026 0002 438a 7ae4 0004 7ed4 7fdc 8130 7fc4
3246160  7ebc 0000 0014 9f2c 0010 8924 0018 885c 228c 0007 b464 34fa 0013 c44c 0015 87f4 0014 816c 0000 0010 0015 40ac 0000 0008
3246240  b464 4d60 0014 1668 000d 4d5c 0011 2568 3a25 3032 693a 2530 3273 2025 3141 4d00 b464 3d80 0014 16d8 0015 3d7c 0014 5444
```

```
3246320  0200 6e67 0000 3287 0000 0008 0012 c780 0012 c780 0041 0000 0000 0000 0014 547c 0200 6e6f 0000 3287 0000 0008 0012 c858
3246400  0012 c858 0041 0000 0000 0000 0014 54b4 0200 6e77 0000 3287 0000 0008 0015 35bc 0015 35bc 0041 0000 0000 0000 2c78 0010
3246460  0002 438a 239c 0000 0014 54c4 0014 5524 0300 6e7f 0000 3287 0000 000c 0015 35ec 0015 35ec 0041 0000 0000 0000 2c78 0010
3246540  0002 438a 239c 0000 0014 54fc 0015 35cc 0400 6e7f 0000 3287 0000 0010 0015 361c 0015 361c 0041 0000 0000 0000 2c78 0010
3246620  0002 438a 239c 0000 0014 5534 0014 5544 0300 6e87 0000 3287 0000 000c 0015 364c 0015 364c 0041 0000 0000 0000 2c78 0010
3246700  0002 438a 239c 0000 0014 5554 0014 55c4 0200 6e8f 0000 3287 0000 0008 0015 367c 0015 367c 0041 0000 0000 0000 2c78 0010
3246760  0002 438a 239c 0000 0014 5594 0015 365c 0300 6e8f 0000 3287 0000 000c 0015 36ac 0015 36ac 0041 0000 0000 0000 2c78 0010
3247040  0002 438a 239c 0000 0014 55d4 0014 561c 0200 6e97 0000 3287 0000 0008 0015 36dc 0015 36dc 0041 0000 0000 0000 2c78 0010
3247120  0002 438a 239c 0000 0014 55f4 0015 36oc 0300 6e97 0000 3287 0000 000c 0015 370c 0015 370c 0041 0000 0000 0000 2c78 0010
3247200  0002 438a 239c 0000 0014 562c 0014 566c 0200 6e9f 0000 3287 0000 0008 0015 373c 0015 373c 0041 0000 0000 0000 2c78 0010
3247260  0002 438a 239c 0000 0014 564c 0015 371c 0300 6e9f 0000 3287 0000 000c 0015 376c 0015 376c 0041 0000 0000 0000 2c78 0010
3247340  0002 438a 239c 0000 0014 567c 0014 56c4 0100 6ea7 0000 3287 0000 0004 0015 379c 0015 379c 0041 0000 0000 0000 2c78 0010
3247420  0002 438a 239c 0000 0014 569c 0015 377c 0200 6ea7 0000 3287 0000 0008 0015 37cc 0015 37cc 0041 0000 0000 0000 2c78 0010
3247500  0002 438a 239c 0000 0014 56d4 0014 56e4 0300 6eaf 0000 3287 0000 000c 0015 37fc 0015 37fc 0041 0000 0000 0000 2c78 0010
3247560  0002 438a 239c 0000 0014 56f4 0014 578c 0300 6eb7 0000 3287 0000 000c 0015 382c 0015 382c 0041 0000 0000 0000 2c78 0010
3247640  0002 438a 239c 0000 0014 572c 0015 380c 0400 6eb7 0000 3287 0000 0010 0015 385c 0015 385c 0041 0000 0000 0000 2c78 0010
3247720  0002 438a 239c 0000 0014 575c 0015 393c 0500 6eb7 0000 3287 0000 0014 0015 388c 0015 388c 0041 0000 0000 0000 2c78 0010
3250000  0002 438a 239c 0000 0014 577c 0015 386c 0600 6eb7 0000 3287 0000 0018 0015 38bc 0015 38bc 0041 0000 0000 0000 2c78 0010
3250060  0002 438a 239c 0000 0014 579c 0014 57ac 0100 2927 0000 3287 0000 0004 0015 38ec 0015 38ec 0041 0000 0000 0000 2c78 0010
3250140  0002 438a 239c 0000 0014 57bc 0014 57cc 0200 6ebf 0000 3287 0000 0008 0015 391c 0015 391c 0041 0000 0000 0000 2c78 0010
3250220  0002 438a 239c 0000 0014 57dc 0014 57fc 0300 6ec7 0000 3287 0000 000c 0015 394c 0015 394c 0041 0000 0000 0000 2c78 0010
3250300  0002 438a 239c 0000 0014 580c 0014 582c 0200 6ecf 0000 3287 0000 0008 0015 397c 0015 397c 0041 0000 0000 0000 2c78 0010
3250360  0002 438a 239c 0000 0014 583c 0014 58cc 0300 6ed7 0000 3287 0000 000c 0015 39ac 0015 39ac 0041 0000 0000 0000 2c78 0010
3250440  0002 438a 239c 0000 0014 587c 0015 398c 0400 6ed7 0000 3287 0000 0010 0015 39dc 0015 39dc 0041 0000 0000 0000 2c78 0010
3250520  0002 438a 239c 0000 0014 58bc 0015 39bc 0500 6ed7 0000 3287 0000 0014 0015 3a0c 0015 3a0c 0041 0000 0000 0000 2c78 0010
3250600  0002 438a 239c 0000 0014 58dc 0014 5944 0300 6edf 0000 3287 0000 000c 0015 3a3c 0015 3a3c 0041 0000 0000 0000 2c78 0010
3250660  0002 438a 239c 0000 0014 58fc 0015 3a1c 0400 6edf 0000 3287 0000 0010 0015 3a6c 0015 3a6c 0041 0000 0000 0000 2c78 0010
3250740  0002 438a 239c 0000 0014 5934 0015 3a4c 0500 6edf 0000 3287 0000 0014 0015 3a9c 0015 3a9c 0041 0000 0000 0000 2c78 0010
3251020  0002 438a 239c 0000 0014 5954 0014 59c4 0200 6ee7 0000 3287 0000 0008 0015 3acc 0015 3acc 0041 0000 0000 0000 2c78 0010
3251100  0002 438a 239c 0000 0014 5974 0015 3aac 0300 6ee7 0000 3287 0000 000c 0015 3afc 0015 3afc 0041 0000 0000 0000 2c78 0010
3251160  0002 438a 239c 0000 0014 59b4 0015 3adc 0500 6ee7 0000 3287 0000 0014 0015 3b2c 0015 3b2c 0041 0000 0000 0000 2c78 0010
3251240  0002 438a 239c 0000 0014 59d4 0014 838c 0100 2fdf 0000 3287 0000 0004 0015 3b5c 0015 3b5c 0041 0000 0000 0000 2c78 0010
3251320  0002 438a 239c 0000 0014 59f4 0014 5a14 0300 6eef 0000 3287 0000 000c 0015 3b8c 0015 3b8c 0041 0000 0000 0000 2c78 0010
3251400  0002 438a 239c 0000 0014 5a24 0014 5a54 0300 6ef7 0000 3287 0000 000c 0015 3bbc 0015 3bbc 0041 0000 0000 0000 2c78 0010
3251460  0002 438a 239c 0000 0014 5a64 0014 5a8c 0200 6eff 0000 3287 0000 0008 0015 3bec 0015 3bec 0041 0000 0000 0000 2c78 0010
3251540  0002 438a 239c 0000 0014 5a9c 0014 5acc 0200 6f07 0000 3287 0000 0008 0015 3c1c 0015 3c1c 0041 0000 0000 0000 2c78 0010
3251620  0002 438a 239c 0000 0014 5adc 0014 5b0c 0300 6f0f 0000 3287 0000 000c 0015 3c4c 0015 3c4c 0041 0000 0000 0000 2c78 0010
3251700  0002 438a 239c 0000 0014 5b1c 0014 5b4c 0200 6f17 0000 3297 0000 0008 0015 3c7c 0015 3c7c 0041 0000 0000 0000 2c78 0010
3251760  0002 438a 239c 0000 0014 5b5c 0014 5bc4 0400 6f1f 0000 3287 0000 0010 0015 3cac 0015 3cac 0041 0000 0000 0000 2c78 0010
3252040  0002 438a 239c 0000 0014 5b9c 0015 3c9c 0500 6f1f 0000 3287 0000 0014 0015 3cdc 0015 3cdc 0041 0000 0000 0000 2c78 0010
3252120  0002 438a 239c 0000 0014 5bd4 0014 5c24 0400 6f27 0000 3287 0000 0010 0015 3d0c 0015 3d0c 0041 0000 0000 0000 2c78 0010
3252200  0002 438a 239c 0000 0014 5bf4 0015 3cec 0500 6f27 0000 3287 0000 0014 0015 3d3c 0015 3d3c 0041 0000 0000 0000 2c78 0010
3252260  0002 438a 239c 0000 0014 5c34 0014 89c8 0100 3037 0000 3287 0000 0004 0015 3d6c 0015 3d6c 0041 0000 0000 0000 2c78 0010
3252340  0002 438a 239c 0000 0014 5c54 b464 a820 0014 1710 0010 a81c 0009 4d55 5831 365f 325f 5300 0009 4d55 5831 365f 335f 5300
3252420  0009 4d55 5831 365f 345f 5300 b464 812c 0014 1a0c 0015 3e9c 0009 4d55 5831 365f 375f 5300 b464 8030 0014 1aa8 0014 84a8
3252500  b464 3de0 0014 1b10 0015 3ddc b464 3e94 0014 1b44 0015 3e90 b464 3df8 0014 1bac 0015 3df4 b464 3e04 0014 1be0 0015 3e00
3252560  b464 8204 0014 1c14 0014 8200 b464 3e1c 0014 1c7c 0015 3e18 b464 3e28 0014 1cb0 0000 0000 b464 4b64 0016 289c 0000 0000
3252640  0009 6675 6e69 7473 2e70 6c00 0007 6461 7465 2e70 6c00 0000 0007 4445 5349 474e 5300 3e3c 0009 4241 5443 482e 5250 5400
3252720  2b24 3e70 0002 438a 0015 ae1a 23c8 86e4 0015 3e60 0015 adb2 0007 6d75 7875 6e69 7400 86e0 0006 4445 5349 474e 0015 3e78
3253000  b464 3dec 0014 1b78 0015 3de8 b464 3dbc 0014 1a40 0014 8134 0009 4d55 5831 365f 355f 5300 b464 3da4 0014 19a4 0014 80fc
3253060  0009 7e6e 297e 6e7e 6e7e 6e00 0009 0929 7e6e 297e 6e7e 6e00 2aa8 0000 0016 20dc 0016 209c 2aa8 3f9c 0016 2110 0015 69f8
3253140  2aa8 3ee8 0015 3ee4 0015 69c0 2aa8 8930 0014 892c 0016 1f3c 0007 6b6e 7574 6862 3100 3fb0 0007 6e6f 6465 6d61 7000 4520
3253220  2b24 3f18 0002 438a 0014 5014 0009 6461 7465 5f70 6c75 7300 0006 5144 706c 7573 0015 3f44 0006 6461 7465 2e6f 0015 3f50
3253300  0009 4d55 5831 365f 385f 5300 b464 3f18 0015 64f8 0016 bde0 0006 5144 6461 7465 0015 3f74 b464 3d8c 0014 1780 0000 0000
3253360  b464 bc3c 0014 1514 0015 bc2c 2aa8 4994 0015 3ed8 0015 6a60 2aa8 85cc 0014 85c8 0016 1fdc 2aa8 3f00 0015 3efc 0016 1f0c
```

```
3253440 0009 6b6e 7574 685f 625f 3100 b464 4038 0015 65ec 0000 0000 b464 89b0 0014 3948 0000 0000 b464 3fcc 0014 38e0 0000 0000
3253520 b464 3fd8 0014 39ac 0015 3fd4 b464 3fe4 0014 3978 0015 3fe0 b464 3ff0 0014 3844 0015 3fec b464 3ffc 0014 37dc 0015 4034
3253600 b464 4008 0014 37a8 0015 4004 b464 4014 0014 370c 0015 3fbc b464 4020 000a fe08 0015 401c b464 3fb4 0015 6620 0000 0000
3253660 0006 6461 7469 6165 0000 0000 0015 8620 0014 543c 0003 6e6f 7700 405c 0004 6461 7465 0000 0015 58b4 0014 5434 0014 4550
3253740 0000 0000 0014 45a0 0015 406c 0026 2020 2020 2043 6d69 7053 697a 6572 2063 6f6d 706c 6574 6564 2073 7563 6365 7373 6675
3254020 6c6c 792e 0000 315f 0015 4250 0000 0090 b288 b66c 0000 0f17 7fff ffff 0015 4084 0200 0db5 0100 15ad 0100 33fd 0000 000b
3254100 0000 315f 0015 4110 0000 0039 b27c b66c 0000 0f18 0000 0f4b 0015 4254 0200 0db5 0500 1cdd 0000 7197 0000 0013 0000 3287
3254160 00ad 58e3 0000 03a3 0000 315f 0015 4250 0000 002c b4f0 b4e4 0000 0f17 7fff ffff 0008 b0dd 0000 0000 0000 0000 0015 5948
3254240 0002 438a 0015 bca4 2c78 0114 0002 439a 2520 46ec 3348 4cc4 0000 719f 3804 247c 0015 ab3c 0018 42ac 0000 71af 0008 ec1c
3254320 0018 247c 0008 d13c 0018 2ba0 0018 0048 4538 4af8 0000 71bf 5370 4550 6d94 6b74 4538 4af8 0000 71b7 6bb4 247c 0015 3d5c
3254400 0014 2ecc 4300 0000 0000 71c7 0008 ec1c 0014 247c 0008 d13c 0014 247c 0008 d13c 0014 2c88 002c 2c58 24d0 0000 0008 d13c
3254460 0014 42ac 0000 71cf 0008 ec1c 0014 247c 0008 d13c 0014 247c 0008 d13c 0014 c5a8 4300 0000 0000 71df 0015 ab5c 0014 33a0
3254540 44e8 0000 0200 2027 4b8c 0000 0000 71e7 571c 43e4 0200 0daf 4b8c 0000 0000 3287 6c34 247c 0008 c03c 0014 37f0 40cc 0000
3254620 000d 8048 000c 43e4 0200 2027 4b8c 0000 0000 71e7 5fa0 43c0 0200 0daf 4b8c 0000 0000 3287 6bb4 234c 0008 db9c 0015 4354
3254700 0000 0038 b27c b66c 0000 0f19 0000 0f4c 0015 4358 0200 0db5 0500 1cdd 0000 71ef 0000 0013 0000 3287 00ad 5f23 0000 03a3
3254760 0000 315f 2c78 00cc 0002 438a 45dc 46ec 4300 0000 0000 71f7 0008 ec1c 001c 247c 0008 d13c 001c 32b8 4e1c 0000 0000 719f
3255040 3894 3aa0 0015 ab3c 0018 42ac 0000 71ff 0008 ec1c 0018 247c 0008 d13c 0018 4550 6d94 5370 4538 4af8 0000 7207 6bb4 247c
3255120 0015 345c 0014 42ac 0000 71df 0015 ab5c 0014 33a0 44e8 0000 0200 2027 4b8c 0000 0000 71e7 671c 43e4 0200 0daf 4b8c 0000
3255200 0000 3287 6c34 247c 0008 c03c 0014 37f0 40cc 0000 000d 8048 000c 43e4 0200 2027 4b8c 0000 0000 71e7 5fa0 43c0 0200 0daf
3255260 4b8c 0000 0000 3287 6bb4 234c 0008 db9c 0015 43e8 0000 0038 b27c b66c 0000 0f1a 0000 0f4d 0015 43ec 0200 0db5 0500 1cdd
3255340 0000 71a7 0000 0013 0000 3287 00ad 59e3 0000 03a3 0000 315f 2c78 005c 0002 438a 45c4 46d8 24d0 0000 0015 ac54 0014 42ac
3255420 0000 7217 0008 ec1c 0014 247c 0008 d13c 0014 39a4 0015 ac74 0014 2ba0 0014 0012 3ba0 0000 0015 ac94 0010 234c 0015 acb4
3255500 2c58 247c 0015 acb4 0010 39a4 0015 ac34 000c c5a8 0015 446c 0000 0038 b27c b66c 0000 0f1b 0000 0f4e 0015 4470 0200 0db5
3255560 0500 1cdd 0000 61e7 0000 000b 0000 3287 00a0 8f43 0000 03a3 0000 315f 2c78 004c 0002 438a 45c4 33a0 44e8 0000 0100 5eef
3255640 671c 43e4 0200 0daf 4b8c 0000 0000 3287 6c34 247c 0008 c03c 0014 42ac 0000 723f 0008 ec1c 0014 247c 0008 d13c 0014 37f0
3255720 3cf4 234c 0015 ad2c 0015 4590 0000 00e0 b27c b66c 0000 0f1c 0000 0f4f 0015 44a8 0200 0db5 0500 1cdd 0000 7247 0000 0013
3256000 0000 3287 00ad 6963 0000 03a3 0000 315f 0015 44dc 0000 0038 b27c b66c 0000 0f1d 0000 0f50 0015 44e0 0200 0db5 0500 1cdd
3256060 0000 724f 0000 000b 0000 3287 00ad 6f03 0000 03a3 0000 315f 0015 4514 0000 0038 b27c b66c 0000 0f1e 0000 0f51 0015 4518
3256140 0200 0db5 0500 1cdd 0000 7227 0000 000b 0000 3287 00ad 64a3 0000 03a3 0000 315f 0015 4590 0000 0038 b27c b66c 0000 0f1f
3256220 0000 0f52 0015 4594 0200 0db5 0500 1cdd 0000 7267 0000 000b 0000 3287 00ad 79c3 0000 03a3 0000 315f 2c78 0044 0002 438a
3256300 45b8 39a4 0015 af98 0018 3228 332c 39a4 0014 0e28 0018 3228 3348 39a4 0014 0e7c 0018 3d6c 3d30 39a4 0015 afb8 000c 247c
3256360 0015 afd8 000c 234c 0015 aff8 0015 4634 0000 0070 b27c b66c 0000 0f20 0000 0f53 0015 4638 0200 0db5 0500 1cdd 0000 7277
3256440 0000 001b 0000 3287 00ad 7dc3 0000 03a3 0000 315f 0015 4634 0000 0038 b27c b66c 0000 0f29 0000 0f5c 0015 4b3c 0200 0db5
3256520 0500 1cdd 0000 6c17 0000 0013 0000 3287 009d 1b23 0000 03a3 0000 315f 0003 5238 3100 b7ec 2954 002c 0002 438a 56f8 671c
3256600 682c 5758 6750 6100 57b8 6784 6150 247c 0015 ad4c 0018 2ecc 23fc 0000 0015 afb8 0015 46d0 0000 0038 b27c b66c 0000 0f21
3256660 0000 0f54 0015 46d4 0200 0db5 0500 1cdd 0000 728f 0000 001b 0000 3287 00ad 6a63 0000 03a3 0000 315f 2c78 0064 0002 438a
3256740 45e8 001c 4714 4768 3310 42ac 0000 7297 0012 11f8 0020 332c 3b4c 0000 0015 b114 0020 37dc 3af4 001c 0015 b134 001c 37dc
3257020 3c48 0000 0015 b154 0018 37dc 3bf4 0000 0015 b174 0014 39a4 0015 b194 0014 3228 3d30 3cf4 242c 0000 0015 b1b4 0015 4774
3257100 0000 0038 b27c b66c 0000 0f22 0000 0f55 0015 4778 0200 0db5 0500 1cdd 0000 72a7 0000 0013 0000 3287 00ad 89a3 0000 03a3
3257160 0000 315f 2c78 0038 0002 438a 2520 4618 33d8 3364 24d0 0000 0015 aebc 001c 332c 4108 0000 0015 358c 0018 4210 0000 000b
3257240 3d6c 3d30 2420 0000 0015 b1f4 0031 2a2a 2a20 4572 726f 723a 2043 616e 6e6f 7420 6669 6e64 207e 6420 6269 7420 7265 6720
3257320 696e 2074 6865 206c 6962 7261 7279 2e00 0015 4824 0000 0038 b27c b66c 0000 0f23 0000 0f56 0015 4828 0200 0db5 0500 1cdd
3257400 0000 72af 0000 0013 0000 3287 00ad 8aa3 0000 03a3 0000 315f 2c78 0076 0002 438a 453c 46d8 31a4 31d4 001c aa6c aab4 0000
3257460 a2bc 005a 2ba0 0020 001c 386c 382c 001c 4300 0000 0000 0083 0015 b224 0020 2ecc 2c88 001e 2c58 4550 4b8c 0000 0000 0083
3257540 5370 42ac 0000 72df 0008 c0fc 0020 c5a8 332c 411c 0000 001c 0015 358c 001c 38e8 3d6c 3d30 2420 0000 0015 b1f4 22a0 3b20
3257620 0015 4968 0000 0070 b27c b66c 0000 0f24 0000 0f57 0015 4860 0200 0db5 0500 1cdd 0000 72b7 0000 0013 0000 3287 00ad 8ba3
3257700 0000 03a3 0000 315f 0015 4968 0000 0038 b27c b66c 0000 0f25 0000 0f58 0015 496c 0200 0db5 0500 1cdd 0000 72e7 0000 0013
3257760 0000 3287 00ad 93c3 0000 03a3 0000 315f 003b 2a2a 2a20 4572 726f 723a 2043 616e 6e6f 7420 6669 6e64 207e 6420 6269 7420
3260040 7e64 2070 6f72 7420 6d75 7820 696e 2074 6865 206c 6962 7261 7279 7e6e 2e00 6d70 2954 0094 0002 438a 45b8 5758 671c 6a00
3260120 5d10 0000 0200 6d7f 6af0 0020 6af0 0024 31bc 31d4 001c 2ba0 0028 001e 38e8 3894 001c 382c 0024 3c9c 0000 0020 0015 b2a8
3260200 0028 2ecc 2c88 0022 2c58 4538 6e58 0024 5370 4550 6e58 0020 6b74 42ac 0000 72f7 0008 c0fc 0020 c5a8 3348 411c 0000 001c
3260260 0015 358c 001c 4210 0000 000b 3d78 3d3c 3b4c 0000 0015 b1f4 0014 2ecc 2410 0000 0015 b278 0015 4a10 0000 0038 b27c b66c
3260340 0000 0f26 0000 0f59 0015 4a14 0200 0db5 0500 1cdd 0000 725f 0000 001b 0000 3287 00ad 75e3 0000 03a3 0000 315f 2c78 0070
3260420 0002 438a 2520 46ec 4768 3364 24d0 0000 000b 4af4 001c 3310 4108 0000 0014 0c78 0018 2ba0 0018 0012 386c 37f0 3b4c 0000
3260500 0015 b314 0010 2eb0 2c58 247c 0008 d13c 0010 42ac 0000 7307 0008 ec1c 0010 4064 0008 ec1c 000c 42ac 0000 730f 0008 ec1c
```

```
3260560  000c 247c 0008 d13c 000c c5a8 0015 4b38 0000 0070 b27c b66c 0000 0f27 0000 0f5a 0015 4a4c 0200 0db5 0500 1cdd 0000 6e17
3260640  0000 0013 0000 3287 00a0 9aa3 0000 03a3 0000 315f 0015 4b38 0000 0038 b27c b66c 0000 0f28 0000 0f5b 0015 45cc 0200 0db5
3260720  0500 1cdd 0000 6157 000c 0013 0000 3287 00a0 63c3 0000 03a3 0000 315f 2c78 0078 0002 438a 3690 2520 332c 4568 4b8c 0000
3261000  0000 0263 5370 4538 4b8c 0000 0000 0223 6bf4 4568 4b8c 0000 0000 0233 6b74 4538 4b8c 0000 0000 0173 6bf4 4568 6b74 5370
3261060  4538 6c08 6bf4 247c 0015 366c 0014 33a0 4254 0000 0000 3387 40e0 0000 0008 d3dc 0010 3d24 4240 0000 0000 73b7 242c 0000
3261140  0011 ffa0 0004 2e46 444c 0000 2954 0038 0002 438a 56f8 671c 682c 5758 6aa0 6a00 35c8 32b8 24d0 0000 000b 09b0 001c 3818
3261220  40f4 0000 0012 04e8 0014 2ecc 2410 0000 0013 a364 0015 4c54 0000 0038 b27c b66c 0000 0f2a 0000 0f5d 0015 4c58 0200 0db5
3261300  0500 1cdd 0000 726f 0000 000b 0000 3287 00ad 7cc3 0000 03a3 0000 315f 2c78 00e4 0002 438a 45e8 0020 24d0 0000 0015 b42c
3261360  0024 43e4 0200 2027 4b8c 0000 0000 6d5f 5fa0 43c0 0200 0daf 4b8c 0000 0000 3287 6bb4 247c 0008 db9c 0024 43e4 0200 2027
3261440  4b8c 0000 0000 6d67 5fa0 43c0 0200 0daf 4b8c 0000 0000 3287 6bb4 247c 0008 db9c 0024 3380 001c 3c9c 0000 0020 000e 4a50
3261520  0020 3364 40b4 001c 000b 4af4 001c 3348 4108 0000 000b 5cb4 0018 3d3c 4300 0000 0000 6d5f 0011 ffa0 0014 4368 4300 0000
3261600  0000 6d67 0011 ffa0 0014 42ac 0000 5eef 0010 da8c 0014 332c 4300 0000 0000 5eef 0010 dfb4 0014 33a0 3d30 42ac 0000 731f
3261660  0015 353c 0010 3cf4 242c 0000 0015 b44c 0015 4cec 0000 0038 b27c b66c 0000 0f2b 0000 0f5e 0015 4cf0 0200 0db5 0500 1cdd
3261740  0000 7287 0000 0003 0000 3287 00ad 7fc3 0000 03a3 0000 315f 2c78 0060 0002 438a 2520 247c 0015 b490 000c 43e4 0200 2027
3262020  4b8c 0000 0000 6d5f 5fa0 43c0 0200 0daf 4b8c 0000 0000 3287 6bb4 247c 0008 db9c 000c 43e4 0200 2027 4b8c 0000 0000 6d67
3262100  5fa0 43c0 0200 01af 4b8c 0000 0000 3287 6bb4 234c 0008 db9c 0015 4d68 0000 0038 b27c b66c 0000 0f2c 0000 0f5f 0015 4d6c
3262160  0200 0db5 0500 1cdd 000c 720f 0000 0003 0000 3287 00ad 62a3 0000 03a3 0000 315f 2c78 0044 0002 438a 2520 43e4 0200 2027
3262240  4b8c 0000 0000 71e7 5fa0 43c0 0200 0daf 4b8c 0000 0000 3287 6bb4 247c 0008 db9c 000c 42ac 0000 5eef 0010 d38c 000c 234c
3262320  0015 b42c 0015 4e50 0000 0070 b27c b66c 0000 0f2d 0000 0f60 0015 4da4 0200 0db5 0500 1cdd 0000 7317 0000 0003 0000 3287
3262400  00ad a163 0000 03a3 0000 315f 0015 4e50 0000 0038 b27c b66c 0000 0f2e 0000 0f61 0015 4e54 0200 0db5 0500 1cdd 0000 721f
3262460  0000 000b 0000 3287 00ad 63a3 0000 0313 0000 315f 2c78 0078 0002 438a 3690 2520 332c 4568 4b8c 0000 000c 0263 5370 4538
3262540  4b8c 0000 0000 0223 6bf4 4568 4b8c 0000 0000 0223 6b74 4538 4b8c 0000 0000 0173 6bf4 4568 6b74 5370 4538 6c08 6bf4 247c
3262620  0015 366c 0014 33a0 4254 0000 0000 3387 40e0 0000 0008 d3dc 0010 3d24 4240 0000 0000 7297 242c 0000 0011 ffa0 0015 4f80
3262700  0000 00e0 b27c b66c 0000 0f2f 0000 0f62 0015 4e8c 0200 0db5 0500 1cdd 0000 722f 0000 0003 0000 3287 00ad 65a3 0000 03a3
3262760  0000 315f 0015 4ec0 0000 0038 b27c b66c 0000 0f30 0000 0f63 0015 4ec4 0200 0db5 0500 1cdd 0000 7237 0000 000b 0000 3287
3263040  00ad 56a3 0000 03a3 0000 315f 0015 4ef8 0000 0038 b27c b66c 0000 0f31 0000 0f64 0015 4efc 0200 0db5 0500 1cdd 0000 7327
3263120  0000 000b 0000 3287 00ad a263 0000 03a3 0000 315f 0015 4f80 0000 0038 b27c b66c 0000 0f32 0000 0f65 0015 4f84 0200 0db5
3263200  0500 1cdd 0000 7327 0000 0013 0000 3287 00ad a163 0000 03a3 0000 315f 2c78 0050 0002 438a 45b8 46ec 9314 93a8 0016 37f0
3263260  4300 0000 0000 731f 0015 358c 0018 2c88 0002 3348 4300 0000 0000 7347 0015 a9f8 0018 4538 6194 5370 4568 6d50 6b74 41e8
3263340  0000 734f 2420 0000 0038 c11c 0015 502c 0000 0070 b27c b66c 0000 0f33 0000 0f66 0015 4fbc 0200 01b5 0500 1cdd 0000 729f
3263420  0000 000b 0000 3287 00ad b003 0000 03a3 0000 315f 0015 502c 0000 0038 b27c b66c 0000 0f34 0000 0f67 0015 5030 0200 0db5
3263500  0500 1cdd 0000 729f 0000 0013 0000 3287 00ad 88a3 0000 03a3 0000 315f 2c78 003c 0002 438a 45b8 46ec 9314 93a8 0016 37f0
3263560  4300 0000 0000 7357 0015 358c 0014 2c88 0002 4568 6d50 5370 4254 0000 0000 735f 2420 0000 0008 c11c 0015 5134 0000 00a8
3263640  b27c b66c 0000 0f35 0000 0f68 0015 5068 0200 01b5 0500 1cdd 0000 72bf 0000 0003 0000 3287 00ad b383 0000 03a3 0000 315f
3263720  0015 509c 0000 0038 b27c b66c 0000 0f36 0000 0f69 0015 50a0 0200 0db5 0500 1cdd 0000 72bf 0000 000b 0000 3287 00ad 8ca3
3264000  0000 03a3 0000 315f 0015 5134 0000 0038 b27c b66c 0000 0f37 0000 0f6a 0015 5138 0200 0db5 0500 1cdd 0000 72cf 0000 001b
3264060  0000 3287 00ad b763 0000 03a3 0000 315f 2c78 002c 0002 438a 45c4 4700 477c 3310 4300 0000 0000 7297 0012 11f8 001c 38e8
3264140  386c 37f0 3cf4 234c 0015 b1f4 002e 2020 2020 286d 6567 6166 756e 205e 6e61 6d65 207e 7720 5e69 6e64 6e61 6d65 207e 7720
3264220  5e74 696d 6573 207e 6429 7e6e 0072 2c20 0015 51b8 0000 0038 b27c b66c 0000 0f38 0000 0f6b 0015 51bc 0200 0db5 0500 1cdd
3264300  0000 72cf 0000 0023 0000 3287 00ad 8fa3 0000 03a3 0000 315f 2c78 004c 0002 438a 45b8 46ec 4768 47e4 9314 93a8 0016 37f0
3264360  4300 0000 0000 736f 0015 358c 001c 2c88 0002 4550 63d8 5370 4538 6d94 6bb4 4568 6d50 6b74 4254 0000 0000 7377 2420 0000
3264440  0008 c11c 0015 5268 0000 0070 b27c b66c 0000 0f39 0000 0f6c 0015 51f4 0200 0db5 050c 1cdd 0000 72c7 0000 0013 0000 3287
3264520  00ad b923 0000 03a3 0000 315f 0015 5268 0000 0038 b27c b66c 0000 0f3a 0000 0f6d 0015 526c 0200 03b5 0500 1cdd 0000 72c7
3264600  0000 001b 0000 3287 00ad ada3 0000 03a3 0000 315f 2c78 0040 0002 438a 45b8 4700 4754 9314 93a8 0014 37f0 42ac 0000 737f
3264660  0015 358c 0018 2c88 0002 4538 6194 5370 4568 6d50 6b74 41e8 0000 7387 2420 0000 0008 c11c 0015 5300 0000 0038 b27c b66c
3264740  0000 0f3b 0000 0f6e 0015 5304 0200 0db5 0500 1cdd 0000 727f 0000 0003 0000 3287 00ad 7ec3 0000 03a3 0000 315f 2c78 0030
3265020  0002 438a 2520 3310 4300 0000 0000 7297 0012 11f8 0010 31f0 362c 4c70 0000 738f 320c 3cf4 242c 0000 0015 b7bc 002c 2873
3265100  6574 7469 6e67 205e 6e61 6d65 207e 7720 5e61 7320 6675 6e63 205e 7465 6368 6e6f 6c6f 6779 207e 7729 7e6e 0074 0015 5378
3265160  0000 0038 b27c b66c 0000 0f3c 0000 0f6f 0015 537c 0200 0db5 0500 1cdd 0000 727f 0000 001b 0000 3287 00ad b1e3 0000 03a3
3265240  0000 315f 2c78 0040 0002 438a 45b8 46ec 4768 9314 93a8 0014 37f0 42ac 0000 7397 0015 358c 0018 2c88 0002 4538 6d94 5370
3265320  4568 6d50 6b74 41e8 0000 739f 2420 0000 0008 c11c 0015 55f4 0000 0250 b27c b66c 0000 0f3d 0000 0f70 0015 53b4 0200 0db5
3265400  0500 1cdd 0000 732f 0000 0003 0000 3287 00ad a483 0000 03a3 0000 315f 0015 53e8 0000 0038 b27c b66c 0000 0f3e 0000 0f71
3265460  0015 53ec 0200 0db5 0500 1cdd 0000 732f 0000 000b 0000 3287 00ad c143 0000 03a3 0000 315f 0015 5420 0000 0038 b27c b66c
3265540  0000 0f3f 0000 0f72 0015 5524 0200 0db5 0500 1cdd 0000 73af 0000 000b 0000 3287 00ad c483 0000 03a3 0000 315f 0015 5460
3265620  0000 0040 0000 0000 0015 bb18 0000 0000 0015 a719 0000 0000 0015 b8e4 0015 b94c 0000 0000 0015 b9bc 0000 0000 0015 ba44
```

```
3265700  0000 0000 0000 0000 0015 b79c 0015 5520 0000 00c0 0000 0000 0015 b610 0015 b1d4 0015 b204 0015 b244 0015 b680 0015 b734
3265760  0015 b6fc 0000 0000 0000 0000 0015 b288 0000 0000 0000 0000 0000 0000 0000 0000 0000 0015 b4b0 0000 0000 0015 b564
3266040  0015 b7d4 0000 0000 0000 0000 0000 0000 0000 0000 0015 b354 0000 0000 0000 0000 0000 0000 0000 0000 0000 0000 0000 0000
3266120  0000 0000 0000 0000 0000 0000 0000 0000 0015 b8a0 0000 0000 0015 b8e4 0015 b94c 0000 0000 0015 b9bc 0000 0000 0015 ba44
3266200  0000 0000 0000 0000 0000 0000 0015 5558 0000 0038 b27c b66c 0000 0f40 0000 0f73 0015 555c 0200 0db5 0500 1cdd 0000 73bf
3266260  0000 0003 0000 3287 00ad c6a3 0000 03a3 0000 315f 0015 5590 0000 0038 b27c b66c 0000 0f41 0000 0f74 0015 5594 0200 0db5
3266340  0500 1cdd 0000 73c7 0000 000b 0000 3287 00ad c9e3 0000 03a3 0000 315f 0015 55f4 0000 0038 b27c b66c 0000 0f42 0000 0f75
3266420  0015 55f8 0200 0db5 0500 1cdd 0000 7317 0000 000b 0000 3287 00ad cd63 0000 03a3 0000 315f 0029 2866 756e 6374 696f 6e6c
3266500  6962 7261 7279 295e 6e61 6d65 297e 7720 5e64 6174 6520 227e 7722 297c 6e7e 6e00 0015 5660 0000 0038 b27c b66c 0000 0f43
3266560  0000 0f76 0015 5664 0200 0db5 0500 1cdd 0000 73d7 0000 0013 0000 3287 00ad d003 0000 03a3 0000 315f 2c78 0034 0002 438a
3266640  45b8 46ec 3348 42ac 0000 7347 0015 a9f8 0018 4538 6d94 5370 4568 6d50 6b74 41e8 0000 73df 2420 0000 0008 c11c 0015 56d0
3266720  0000 0038 b27c b66c 0000 0f44 0000 0f77 0015 56d4 0200 0db5 0500 1cdd 0000 73e7 0000 0023 0000 3287 00ad d1a3 0000 03a3
3267000  0000 315f 2c78 0038 0002 438a 45c4 4700 477c 47f8 001c 3310 4300 0000 0000 73b7 0012 11f8 0020 3984 0018 001c 38e8 386c
3267060  37f0 3cf4 242c 0000 0015 ba64 0015 57dc 0000 0038 b27c b66c 0000 0f45 0000 0f78 0015 57e0 0200 0db5 0500 1cdd 0000 73e7
3267140  0000 002b 0000 3287 00ad d323 0000 03a3 0000 315f 2c78 00a0 0002 438a 45b8 4728 001c 477c 47d0 482c 0018 4568 6e1c 001c
3267220  5370 41e8 0000 73ef 3b4c 0000 0008 c11c 0020 4568 6e1c 001c 5370 41e8 0000 73f7 3b4c 0000 0008 c11c 001c 4568 6dd8 5370
3267300  4254 0000 0000 73ff 3b4c 0000 0008 c11c 0018 4568 6d94 5370 4254 0000 0000 7407 3b4c 0000 0008 c11c 0014 4568 6d50 5370
3267360  4254 0000 0000 740f 3b4c 0000 0008 c11c 0010 437c 4254 0000 0000 7417 2420 0000 0008 c11c 002e 2020 2020 2045 7272 6f72
3267440  206f 6363 7572 7265 6420 7768 696c 6520 6578 6563 7574 696e 6720 4368 6970 5369 7a65 722e 0020 7265 0015 5944 0000 0038
3267520  b27c b66c 0000 0f46 0000 0f79 0015 5948 0200 0db5 0500 1cdd 0000 741f 0000 0013 0000 3287 00ad d843 0000 03a3 0000 315f
3267600  27f0 0098 0015 59a8 4e1c 0000 0000 7427 2520 4648 4300 0000 0000 71ff 0008 ec1c 0010 247c 0008 d13c 0010 2ba0 0010 0042
3267660  4538 4af8 0000 71bf 5370 4550 6d0c 6b74 4538 4af8 0000 71b7 6bb4 247c 0015 3d5c 000c 2ecc 4300 0000 0000 71c7 0008 ec1c
3267740  000c 247c 0008 d13c 000c 234c 0008 d13c 2c58 247c 0008 d13c 000c 42ac 0000 742f 0008 ec1c 000c 247c 0008 d13c 000c 247c
3270020  0008 d13c 000c c5a8 2954 0098 0002 438a 4e1c 0000 0000 7437 2520 46d8 4300 0000 0000 71ff 0008 ec1c 0010 247c 0008 d13c
3270100  0010 2ba0 0010 0042 4538 4af8 0000 71bf 5370 4550 6d0c 6b74 4538 4af8 0000 743f 6bb4 247c 0015 3d5c 000c 2ecc 4300 0000
3270160  0000 71c7 0008 ec1c 000c 247c 0008 d13c 000c 234c 0008 d13c 2c58 247c 0008 d13c 000c 42ac 0000 742f 0008 ec1c 000c 247c
3270240  0008 d13c 000c 247c 0008 d13c 000c c5a8 0015 5ae4 0000 0038 b130 b66c 0000 0f47 0000 0f7a 0015 4115 0200 0db5 0500 1cdd
3270320  0000 741f 0000 001b 0000 3287 00ad dd43 0000 03a3 0000 315f 27f0 00b4 0015 5a2c 4e1c 0000 0000 7427 2520 46ec 4740 42ac
3270400  0000 71ff 0008 ec1c 0014 247c 0008 d13c 0014 2ba0 0014 005e 4550 4af8 0000 71bf 5370 4538 6d50 6bb4 4550 4af8 0000 7457
3270460  6b74 4538 4b8c 0000 0000 744f 6bb4 4550 6d0c 6b74 4538 4af8 0000 7447 6bb4 247c 0015 3d5c 000c 2ecc 4300 0000 0000 71c7
3270540  0008 ec1c 000c 247c 0008 d13c 000c 234c 0008 d13c 2c58 247c 0008 d13c 000c 42ac 0000 742f 0008 ec1c 000c 247c 0008 d13c
3270620  000c 247c 0008 d13c 000c c5a8 2954 00b4 0002 438a 4e1c 0000 0000 7437 2520 46ec 4740 42ac 0000 71ff 0008 ec1c 0014 247c
3270700  0008 d13c 0014 2ba0 0014 005e 4550 4af8 0000 71bf 5370 4538 6d50 6bb4 4550 4af8 0000 7457 6b74 4538 4b8c 0000 0000 744f
3270760  6bb4 4550 6d0c 6b74 4538 4af8 0000 745f 6bb4 247c 0015 3d5c 000c 2ecc 4300 0000 0000 71c7 0008 ec1c 000c 247c 0008 d13c
3271040  000c 234c 0008 d13c 2c58 247c 0008 d13c 000c 42ac 0000 742f 0008 ec1c 000c 247c 0008 d13c 000c 247c 0008 d13c 000c c5a8
3271120  0015 62a8 0000 05a4 0000 0000 0015 b7ed 0015 b564 0015 bc8d 0015 b52c 0000 0000 0000 0000 0000 0000 0000 0000 0000 0000
3271200  0000 0000 0000 0000 0000 0000 0015 b79c 0000 0000 0000 0000 0000 0000 0015 b610 0000 0000 0015 b8a0 0000 0000 0015 bc6d
3271260  0015 bc5d 0015 b6fc 0015 b9bc 0000 0000 0015 ba44 0000 0000 0000 0000 0000 0000 0015 62a8 0000 0524 202d 3e0a 0920 2020
3271340  2064 6174 655f 706c 7573 5f31 2841 2c42 2c20 5930 2c4d 302c 4430 2c48 302c 4930 2c53 302c 2059 312c 4d31 2c44 312c 4831
3271420  2c49 312c 5331 290a 093b 2020 2076 6172 2859 3029 202d 3e0a 0920 2020 2064 6174 655f 706c 7573 5f32 2841 2c42 2c20 5931
3271500  2c4d 312c 4431 2c48 312c 4931 2c53 312c 2059 302c 4d30 2c44 302c 4830 2c49 302c 5330 290a 093b 2020 2064 6174 655f 706c
3271560  7573 5f33 2841 2c42 2c20 5931 2c4d 312c 4431 2c48 312c 4931 2c53 312c 2059 302c 4d30 2c44 302c 4830 2c49 302c 5330 290a
3271640  0929 2e0a 0a0a 2520 2020 6461 7465 5f70 6c75 735f 3128 3c44 656c 7461 3e2c 203c 5469 6d65 303e 2c20 3c54 696d 6531 3e29
3271720  0a25 2020 2061 6464 7320 3c44 656c 7461 3e20 746f 203c 5469 6d65 303e 2067 6976 696e 6720 3c54 696d 6531 3e0a 0a64 6174
3272000  655f 706c 7573 5f31 2841 2c42 2c20 5930 2c4d 302c 4430 2c48 302c 4930 2c53 302c 2059 312c 4d31 2c44 312c 4831 2c49 312c
3272060  5331 2920 3a2d 0a09 7768 656e 2859 302c 4d30 2c44 302c 4830 2c49 302c 5330 2c20 432c 4429 2c0a 0927 5144 706c 7573 2728
3272140  432c 442c 2020 312c 2041 2c42 2c20 452c 4629 2c0a 0964 6174 6528 312c 2045 2c46 2c20 5931 2c4d 312c 4431 2c48 312c 4931
3272220  2c53 3129 2e0a 0a25 2020 2064 6174 655f 706c 7573 5f32 283c 4465 6c74 613e 2c20 3c54 696d 6531 3e2c 203c 5469 6d65 303e
3272300  290a 2520 2020 7375 6274 7261 6374 7320 3c44 656c 7461 3e20 6672 6f6d 203c 5469 6d65 313e 2067 6976 696e 6720 3c54 696d
3272360  6530 3e0a 0a64 6174 655f 706c 7573 5f32 2841 2c42 2c20 5931 2c4d 312c 4431 2c48 312c 4931 2c53 312c 2059 302c 4d30 2c44
3272440  302c 4830 2c49 302c 5330 2920 3a2d 0a09 7768 656e 2859 312c 4d31 2c44 312c 4831 2c49 312c 5331 2c20 452c 4629 2c0a 0927
3272520  5144 706c 7573 2728 452c 462c 202d 312c 2041 2c42 2c20 432c 4429 2c0a 0964 6174 6528 312c 2043 2c44 2c20 5930 2c4d 302c
3272600  4430 2c48 302c 4930 2c53 3029 2e0a 0a25 2020 2064 6174 655f 706c 7573 5f33 283c 4465 6c74 613e 2c20 3c54 696d 6531 3e2c
3272660  203c 5469 6d65 303e 290a 2520 2020 7375 6274 7261 6374 7320 3c54 696d 6530 3e20 6672 6f6d 203c 5469 6d65 313e 2067 6976
3272740  696e 6720 3c44 656c 7461 3e2e 0a0a 6461 7465 5f70 6c75 735f 3328 412c 422c 2059 312c 4d31 2c44 312c 4831 2c49 312c 5331
```

```
3273020  2c20 5930 2c4d 302c 4430 2c48 302c 4930 2c53 3029 203a 2d0a 0977 6865 6e28 5930 2c4d 302c 4430 2c48 302c 4930 2c53 302c
3273100  2043 2c44 292c 0a09 7768 656e 2859 312c 4d31 2c44 312c 4831 2c49 312c 5331 2c20 452c 4629 2c0a 0927 5144 706c 7573 2728
3273160  452c 462c 202d 312c 2043 2c44 2c20 412c 4229 2e0a 0a0a 2c20 412c 2042 290a 0929 2e0a 0a0a 2520 2020 7469 6d65 283f 486f
3273240  7572 2c20 3f4d 696e 7574 652c 203f 5365 636f 6e64 290a 2520 2020 7265 7475 726e 7320 7468 6520 6375 7272 656e 7420 7469
3273320  6d65 2028 3234 2d68 6f75 7220 636c 6f63 6b2c 206c 6f63 616c 2074 696d 6529 2e20 2046 6f72 2065 7861 6d70 6c65 2c0a 2520
3273400  2020 3130 2074 6f20 3720 696e 2074 6865 2065 7665 6e69 6e67 2077 6f75 6c64 2048 6f75 723d 3138 2c20 4d69 6e75 7465 3d35
3273460  302c 2053 6563 6f6e 643d 302e 0a25 2020 2054 6869 7320 6973 2066 6f72 2062 6163 6b77 6172 6473 2063 6f6d 7061 7469 6269
3273540  6c69 7479 2077 6974 6820 6c69 6272 6172 7928 7469 6d65 5f64 6174 6529 3b20 7573 6520 7469 6d65 2f31 2e0a 0a74 696d 6528
3273620  482c 2049 2c20 5329 203a 2d0a 0964 6174 6528 332c 2030 2c20 302c 205f 2c20 5f2c 205f 2c20 482c 2049 2c20 5329 2e0a 0a25
3273700  2020 2074 696d 6528 3f54 696d 6529 0a25 2020 2072 6574 7572 6e73 2074 6865 2063 7572 7265 6e74 2074 696d 6520 6173 2061
3273760  2074 696d 0012 0678 0100 70af 0000 70af 0000 0004 0015 8358 0015 8358 0001 0076 0000 0000 0015 6084 0200 70af 0000 70af
3274040  0000 0008 0015 839c 0015 839c 0001 0076 0000 0000 0015 60a4 0300 70af 0000 70af 0000 000c 0014 3adc 0014 3adc 0001 0076
3274120  0000 0000 0012 076c 0100 70d7 0000 70af 0000 0004 0015 8508 0015 8508 0001 0076 0000 0000 0012 07c8 0100 70df 0000 70af
3274200  0000 0004 0015 83c0 0015 93c0 0001 0076 0000 0000 0015 6104 0200 70df 0000 70af 0000 0008 0015 83e4 0015 83e4 0001 0076
3274260  0000 0000 0015 6124 0300 70df 0000 70af 0000 000c 0014 3c98 0014 3c98 0001 0076 0000 0000 0012 07e8 0100 70e7 0000 70af
3274340  0000 0004 0015 8408 0015 8408 0001 0076 0000 0000 0015 6164 0200 70e7 0000 70af 0000 0008 0015 842c 0015 842c 0001 0076
3274420  0000 0000 0015 6184 0300 70e7 0000 70af 0000 000c 0015 8450 0015 8450 0001 0076 0000 0000 0015 61a4 0600 70e7 0000 70af
3274500  0000 0018 0014 4040 0014 4040 0001 0076 0000 0000 0015 61c4 0700 70e7 0000 70af 0000 001c 0015 8474 0015 8474 0001 0076
3274560  0000 0000 0012 0808 0200 70ef 0000 70af 0000 0008 0015 84b8 0015 84b8 0001 0076 0000 0000 0015 6204 0300 70ef 0000 70af
3274640  0000 000c 0015 84e0 0015 84e0 0001 0076 0000 0000 0012 0828 0200 70f7 0000 70af 0000 0008 0014 4478 0014 4478 0001 0076
3274720  0000 0000 0015 6244 0300 70f7 0000 70af 0000 000c 0015 8590 0015 8590 0001 0076 0000 0000 0012 0848 0100 70ff 0000 70af
3275000  0000 0004 0014 4778 0014 4778 0001 0076 0000 0000 0015 63c4 0000 002c b288 b66c 0000 0fab 7fff ffff 0015 bcfc 0200 0db5
3275060  0100 15ad 0100 33fd 0000 000b 0000 315f 003c 2f68 6f6d 652f 6f73 6173 312f 612f 7669 6a61 792f 5648 444c 2f70 6172 7365
3275140  722f 7072 6f6c 6f67 2f6e 6577 6e65 772f 7633 2e31 2f65 7374 696d 6174 6573 0025 003f 2f68 6f6d 652f 6f73 6173 312f 612f
3275220  7669 6a61 792f 5648 444c 2f70 6172 7365 722f 7072 6f6c 6f67 2f6e 6577 6e65 772f 7633 2e31 2f65 7374 696d 6174 6573 2e70
3275300  6c00 6675 0000 002c 0015 645c b27c b66c 0000 0fae 7fff ffff 0014 1414 0200 0db5 0200 2f35 0000 7587 0000 03c3 0000 315f
3275360  0000 002c 0015 be30 b27c b66c 0000 0faf 7fff ffff 0015 64b4 0200 0db5 0200 224d 0000 7587 0000 3287 0000 315f 000f 7265
3275440  6164 5f64 7370 5f72 6570 6f72 7400 0000 0015 6484 0000 002c b27c b66c 0000 0fb0 0000 0fee 000a d16d 0200 0db5 0200 270d
3275520  0000 7587 0000 3287 0000 315f 002e 2f68 6f6d 652f 6f73 6173 322f 622f 7175 696e 7475 732f 7077 312e 312f 6c69 6272 6172
3275600  792f 636f 6e76 6572 7369 6f6e 0075 6e69 0031 2f68 6f6d 652f 6f73 6173 322f 622f 7175 696e 7475 732f 7077 312e 312f 6c69
3275660  6272 6172 792f 636f 6e76 6572 7369 6f6e 2e70 6c00 0000 002c 0015 6794 b27c b66c 0000 0fb3 7fff ffff 0015 635c 0200 0db5
3275740  0200 2f35 0000 759f 0000 03cb 0000 315f 0015 67bc 0000 002c b288 b66c 0000 0fb2 7fff ffff 0015 645c 0200 0db5 0100 15ad
3276020  0100 33fd 0000 000b 0000 315f 0000 002c 0015 6388 b27c b66c 0000 0fd8 7fff ffff 0015 6918 0200 0db5 0200 224d 0000 759f
3276100  0000 758f 0000 315f 0011 6d61 7962 655f 6e65 775f 7069 6374 7572 6500 0000 002c 0014 4c6c b27c b66c 0000 0fd9 7fff ffff
3276160  0016 428c 0200 0db5 0200 24bd 0000 3287 0000 758f 0000 315f 0000 002c 0014 35dc b27c b66c 0000 0fb7 7fff ffff 0015 6884
3276240  0200 0db5 0200 284d 0000 758f 0000 759f 0000 315f 0000 0034 0014 39e0 b27c b66c 0000 0fb8 7fff ffff 0015 6580 0200 0db5
3276320  0400 242d 0000 75a7 0000 001b 0000 758f 0000 21cf 0000 315f 0000 0034 0015 654c b27c b66c 0000 0fb9 7fff ffff 0015 65b4
3276400  0200 0db5 0400 242d 0000 75af 0000 001b 0000 758f 0000 21cf 0000 315f 0000 0034 0015 6580 b27c b66c 0000 0fba 7fff ffff
3276460  0015 65e8 0200 0db5 0400 242d 0000 75b7 0000 0013 0000 758f 0000 21cf 0000 315f 0000 0034 0015 65b4 b27c b66c 0000 0fbb
3276540  7fff ffff 0015 661c 0200 0db5 0400 242d 0000 70af 0000 0043 0000 758f 0000 21cf 0000 315f 0000 0034 0015 65e8 b27c b66c
3276620  0000 0fbc 7fff ffff 0015 68b0 0200 0db5 0400 242d 0000 70df 0000 0023 0000 758f 0000 21cf 0000 315f 002d 2f68 6f6d 652f
3276700  6f73 6173 322f 622f 7175 696e 7475 732f 7077 312e 312f 6c69 6272 6172 792f 6b6e 7574 685f 625f 3100 0030 2f68 6f6d 652f
3276760  6f73 6173 322f 622f 7175 696e 7475 732f 7077 312e 312f 6c69 6272 6172 792f 6b6e 7574 685f 625f 312e 706c 002c 002b 2f68
3277040  6f6d 652f 6f73 6173 322f 622f 7175 696e 7475 732f 7077 312e 312f 6c69 6272 6172 792f 6b6e 7574 6862 3100 2525 002e 2f68
3277120  6f6d 652f 6f73 6173 322f 622f 7175 696e 7475 732f 7077 312e 312f 6c69 6272 6172 792f 6b6e 7574 6862 312e 706c 0025 2525
3277200  0038 2f68 6f6d 652f 6f73 6173 322f 622f 7175 696e 7475 732f 6765 6e65 7269 632f 7170 6c69 6232 2e35 2f6c 6962 7261 7279
3277260  2f6b 6e75 7468 5f62 5f31 0065 003b 2f68 6f6d 652f 6f73 6173 322f 622f 7175 696e 7475 732f 6765 6e65 7269 632f 7170 6c69
3277340  6232 2e35 2f6c 6962 7261 7279 2f6b 6e75 7468 5f62 5f31 2e70 6c00 2525 0000 002c 0015 be04 b27c b66c 0000 0fbe 7fff ffff
3277420  0015 645c 0200 0db5 0200 2f35 0000 75f7 0000 03d3 0000 315f 0015 6854 0000 0058 b288 b66c 0000 0fbd 7fff ffff 0015 6794
3277500  0200 0db5 0100 15ad 0100 33fd 0000 000b 0000 315f 0015 6854 0000 002c b288 b66c 0000 0fbd 7fff ffff 0015 67c0 0200 0db5
3277560  0100 15ad 0100 33fd 0000 000b 0000 315f 0000 002c 0015 64b4 b27c b66c 0000 0fc9 7fff ffff 0014 1440 0200 0db5 0200 224d
3277640  0000 75f7 0000 75bf 0000 315f 0011 636c 6963 6b65 645f 6f6e 5f64 6573 6967 6e00 0015 68e0 0000 002c b27c b66c 0000 0fc0
3277720  0000 0fc8 000a d16d 0200 0db5 0200 270d 0000 75f7 0000 75bf 0000 315f 0000 002c 0015 6520 b27c b66c 0000 0fc2 7fff ffff
3300000  0016 2630 0200 0db5 0200 284d 0000 75bf 0000 75f7 0000 315f 0000 0034 0015 661c b27c b66c 0000 0fc3 7fff ffff 0016 265c
3300060  0200 0db5 0400 242d 0000 1ff7 0000 0013 0000 75bf 0000 21cf 0000 315f 0015 6bbc 0000 009c b27c b66c 0000 0fc4 0000 0fca
```

| | | | | | | | | | | | | | | | | | | | | | | | | |
|---|---|---|---|---|---|---|---|---|---|---|---|---|---|---|---|---|---|---|---|---|---|---|---|---|
| 3300140 | 0015 | 6948 | 0200 | 0db5 | 0500 | 1cdd | 0000 | 2def | 0000 | 000b | 0030 | 75bf | 00b0 | f083 | 0000 | 03d3 | 0000 | 315f | 0015 | 6944 | 0000 | 002c | b4f0 | b4e4 |
| 3300220 | 0000 | 0fc3 | 7fff | ffff | 0008 | b0dd | 0000 | 0000 | 0000 | 0000 | 0015 | 6948 | 0002 | 438a | 0015 | bcf0 | 0015 | 6bbc | 0000 | 0038 | b130 | b66c | 0000 | 0fc6 |
| 3300300 | 0000 | 0fcb | 0015 | 691d | 0200 | 0db5 | 0500 | 1cdd | 0000 | 1ff7 | 0000 | 0013 | 0000 | 75bf | 00b0 | ee63 | 0000 | 03d3 | 0000 | 315f | 28c4 | 0038 | 0015 | 69b0 |
| 3300360 | 5d10 | 0000 | 0200 | 17a7 | 4b8c | 0000 | 0000 | 0013 | 5a18 | 0000 | 0200 | 0b3f | 4b8c | 0000 | 0000 | 000b | 4b8c | 0000 | 0000 | 001b | 52c4 | 0000 | 9fd0 | a28f |
| 3300440 | 28c4 | 0038 | 0015 | 69e8 | 5d10 | 0000 | 0200 | 17a7 | 4b9c | 0000 | 0000 | 001b | 5a18 | 0000 | 0200 | 0b3f | 4b8c | 0000 | 0000 | 000b | 4b8c | 0000 | 0000 | 001b |
| 3300520 | 52c4 | 0000 | 9fdc | 43d7 | 28c4 | 0038 | 0016 | 1f9c | 5d10 | 0000 | 0200 | 17a7 | 4b8c | 0000 | 0000 | 0013 | 5a18 | 0000 | 0200 | 0b3f | 4b8c | 0000 | 0000 | 000b |
| 3300600 | 4b8c | 0000 | 0000 | 0023 | 52c4 | 0000 | 9fcc | 1bff | 28c4 | 0030 | 0015 | 6a50 | 5d10 | 0000 | 0200 | 0b3f | 4b8c | 0000 | 0000 | 000b | 5a18 | 0000 | 0100 | 7607 |
| 3300660 | 4b8c | 0000 | 0000 | 0013 | 52c4 | 0000 | 9fdc | 551f | 28c4 | 0030 | 0016 | 202c | 5d10 | 0000 | 0200 | 0b3f | 4b8c | 0000 | 0000 | 000b | 5a18 | 0000 | 0100 | 7607 |
| 3300740 | 4b8c | 0000 | 0000 | 0053 | 52c4 | 0000 | 9f6f | 2def | 28c4 | 0030 | 0015 | 6ab0 | 5d10 | 0000 | 0100 | 4bbf | 5a18 | 0000 | 0200 | 0b3f | 4b8c | 0000 | 0000 | 000b |
| 3301020 | 4b8c | 0000 | 0000 | 0013 | 52c4 | 0000 | 9ff1 | 6fe7 | 28c4 | 0030 | 0015 | 6ae0 | 5d10 | 0000 | 0100 | 4bbf | 5a18 | 0000 | 0200 | 0b3f | 4b8c | 0000 | 0000 | 000b |
| 3301100 | 4b8c | 0000 | 0000 | 001b | 52c4 | 0000 | a015 | b9df | 28c4 | 0030 | 0016 | 218c | 5d10 | 0000 | 0100 | 4bbf | 5a18 | 0000 | 0200 | 0b3f | 4b8c | 0000 | 0000 | 0013 |
| 3301160 | 4b8c | 0000 | 0000 | 001b | 52c4 | 0000 | 9fd6 | a9df | 28c4 | 0038 | 0016 | 2218 | 5d10 | 0000 | 0200 | 17a7 | 4b8c | 0000 | 0000 | 5a9f | 5a18 | 0000 | 0200 | 0b3f |
| 3301240 | 4b6c | 0000 | 0000 | 760f | 4b8c | 0000 | 0000 | 0023 | 52c4 | 0000 | a006 | 2f5f | 0016 | 1fec | 0016 | 22cd | 0016 | 2280 | 0016 | 2325 | 0016 | 1f84 | 0016 | 22e0 |
| 3301320 | 0016 | 1f1c | 0016 | 2231 | 0000 | 0000 | 0000 | 0000 | 0000 | 0000 | 0000 | 0000 | 0000 | 0000 | 0000 | 0000 | 0000 | 0000 | 0000 | 0000 | 28c4 | 0030 | 0016 | 22a4 |
| 3301400 | 5d10 | 0000 | 0200 | 0b3f | 4b8c | 0000 | 0000 | 000b | 5a18 | 0000 | 0100 | 7607 | 4b8c | 0000 | 0000 | 7617 | 52c4 | 0000 | a002 | 7fb7 | 0015 | bcf8 | 0000 | 16f4 |
| 3301460 | 0013 | 5d88 | 0200 | 0df7 | 0015 | 6ba9 | 0015 | 6bb5 | 0200 | 0ad7 | 0015 | 6bac | 0015 | 6bc5 | 0300 | 2a87 | 0013 | 5d38 | 0014 | 78c1 | 0013 | 5d40 | 0200 | 0df7 |
| 3301540 | 0000 | 3387 | 0015 | 6bdd | 0200 | 0ad7 | 0015 | 6bb0 | 0015 | 6bed | 0000 | 22cf | 0600 | 32df | 0000 | 0393 | 0014 | 78f4 | 0014 | 78f8 | 0013 | 5cd9 | 0014 | 1199 |
| 3301620 | 0014 | 7904 | 0300 | 2a87 | 0013 | 5cf0 | 0015 | 6c09 | 0013 | 5cf8 | 0200 | 0df7 | 0015 | 6c19 | 0015 | 6c25 | 0200 | 0ad7 | 0015 | 6c1c | 0015 | 6c35 | 0300 | 2a87 |
| 3301700 | 0013 | 5ca8 | 0014 | 78ed | 0013 | 5cb0 | 0200 | 0df7 | 0000 | 3387 | 0015 | 6c4d | 0200 | 0ad7 | 0015 | 6c20 | 0015 | 6c5d | 0000 | 22cf | 0200 | 0ddf | 0000 | 0007 |
| 3301760 | 0015 | 6662 | 0200 | 0ddf | 0000 | 0007 | 0015 | 663a | 0200 | 0ddf | 0000 | 0007 | 0015 | 6612 | 0200 | 0ddf | 0000 | 0007 | 0015 | 65ea | 0200 | 0ddf | 0000 | 0007 |
| 3302040 | 0015 | 65c2 | 0200 | 0ddf | 0015 | 655a | 0000 | 0007 | 0014 | 1231 | 0015 | 6cca | 0014 | 12b5 | 0015 | 6cd2 | 0014 | 12f9 | 0015 | 6ce2 | 0014 | 1339 | 0015 | 6cea |
| 3302120 | 0014 | 137d | 0000 | 0007 | 0014 | 13bd | 0015 | 6cf2 | 0014 | 1401 | 0015 | 6cfa | 0014 | 1485 | 0000 | 0007 | 0200 | 0ddf | 0015 | 6cc2 | 0000 | 0007 | 0200 | 0ddf |
| 3302200 | 0015 | 6cda | 0000 | 0007 | 0015 | 6d01 | 0000 | 0007 | 0015 | 6d0d | 0000 | 0007 | 0200 | 0ddf | 0000 | 0007 | 0015 | 6d1a | 0200 | 0ddf | 0000 | 0007 | 0015 | 6d22 |
| 3302260 | 0015 | 6d29 | 0000 | 0007 | 0015 | 6d35 | 0000 | 0007 | 0200 | 0ddf | 0000 | 0007 | 0015 | 6d42 | 0200 | 0ddf | 0000 | 0007 | 0015 | 6d4a | 0015 | 6d51 | 0000 | 0007 |
| 3302340 | 0015 | 6d5d | 0000 | 0007 | 0200 | 0ddf | 0000 | 0007 | 0015 | 6d6a | 0200 | 0ddf | 0000 | 0007 | 0015 | 6d72 | 0015 | 6d79 | 0000 | 0007 | 0015 | 6d85 | 0000 | 0007 |
| 3302420 | 0200 | 0ddf | 0000 | 0007 | 0015 | 6d92 | 0200 | 0ddf | 0000 | 0007 | 0015 | 6d9a | 0015 | 6da1 | 0000 | 0007 | 0015 | 6dad | 0000 | 0007 | 0200 | 0ddf | 0000 | 0007 |
| 3302500 | 0015 | 6dba | 0200 | 0ddf | 0000 | 0007 | 0015 | 6dc2 | 0015 | 6dc9 | 0000 | 0007 | 0015 | 6dd5 | 0000 | 0007 | 0200 | 0ddf | 0000 | 0007 | 0015 | 6dba | 0200 | 0ddf |
| 3302560 | 0000 | 0007 | 0015 | 6d92 | 0200 | 0ddf | 0000 | 0007 | 0015 | 6d6a | 0200 | 0ddf | 0000 | 0007 | 0015 | 6d42 | 0200 | 0ddf | 0000 | 0007 | 0015 | 6d1a | 0200 | 0ddf |
| 3302640 | 0015 | 6cc2 | 0000 | 0007 | 0014 | 1231 | 0015 | 6e4a | 0014 | 12b5 | 0015 | 6e52 | 0014 | 12f9 | 0000 | 0007 | 0014 | 137d | 0000 | 0007 | 0200 | 0ddf | 0015 | 6e3a |
| 3302720 | 0000 | 0007 | 0200 | 0ddf | 0015 | 6e42 | 0000 | 0007 | 0015 | 6e59 | 0000 | 0007 | 0015 | 6e65 | 0000 | 0007 | 0200 | 0ddf | 0000 | 0007 | 0015 | 6e72 | 0200 | 0ddf |
| 3303000 | 0000 | 0007 | 0015 | 6e7a | 0015 | 6e81 | 0000 | 0007 | 0015 | 6e8d | 0000 | 0007 | 0200 | 0ddf | 0000 | 0007 | 0015 | 6e9a | 0200 | 0ddf | 0000 | 0007 | 0015 | 6ea2 |
| 3303060 | 0015 | 6ea9 | 0000 | 0007 | 0015 | 6eb5 | 0000 | 0007 | 0200 | 0ddf | 0000 | 0007 | 0015 | 6ec2 | 0200 | 0ddf | 0000 | 0007 | 0015 | 6eca | 0015 | 6e11 | 0000 | 0007 |
| 3303140 | 0015 | 6edd | 0000 | 0007 | 0200 | 0ddf | 0000 | 0007 | 0015 | 6eea | 0200 | 0ddf | 0000 | 0007 | 0015 | 6ef2 | 0015 | 6ef9 | 0000 | 0007 | 0015 | 6f05 | 0000 | 0007 |
| 3303220 | 0200 | 0ddf | 0000 | 0007 | 0015 | 6f12 | 0200 | 0ddf | 0000 | 0007 | 0015 | 6f1a | 0015 | 6f21 | 0000 | 0007 | 0015 | 6f2d | 0000 | 0007 | 0600 | 32df | 0000 | 039b |
| 3303300 | 0014 | 7920 | 0014 | 7924 | 0013 | 5c49 | 0014 | 121d | 0014 | 7930 | 0300 | 2a87 | 0013 | 5c60 | 0015 | 6f49 | 0013 | 5c68 | 0200 | 0df7 | 0015 | 6f58 | 0015 | 6f65 |
| 3303360 | 0200 | 0ad7 | 0015 | 6f5c | 0015 | 6f75 | 0300 | 2a87 | 0013 | 5c18 | 0014 | 7919 | 0013 | 5c20 | 0200 | 0df7 | 0000 | 3387 | 0015 | 6f8d | 0200 | 0ad7 | 0015 | 6f60 |
| 3303440 | 0015 | 6f9d | 0000 | 22cf | 0600 | 32df | 0000 | 03a3 | 0014 | 794c | 0014 | 7950 | 0013 | 5bb9 | 0014 | 12a1 | 0014 | 795c | 0300 | 2a87 | 0013 | 5bd0 | 0015 | 6fb9 |
| 3303520 | 0013 | 5bd8 | 0200 | 0df7 | 0015 | 6fc8 | 0015 | 6fd5 | 0200 | 0ad7 | 0015 | 6fcc | 0015 | 6fe5 | 0300 | 2a87 | 0013 | 5b88 | 0014 | 7945 | 0013 | 5b90 | 0200 | 0df7 |
| 3303600 | 0000 | 3387 | 0015 | 6ffd | 0200 | 0ad7 | 0015 | 6fd0 | 0015 | 700d | 0000 | 22cf | 0200 | 0ddf | 0000 | 0007 | 0015 | 6dc2 | 0200 | 0ddf | 0000 | 0007 | 0015 | 6d9a |
| 3303660 | 0200 | 0ddf | 0000 | 0007 | 0015 | 6d72 | 0200 | 0ddf | 0000 | 0007 | 0015 | 6d4a | 0200 | 0ddf | 0000 | 0007 | 0015 | 6d22 | 0200 | 0ddf | 0015 | 6cda | 0000 | 0007 |
| 3303740 | 0014 | 1339 | 0015 | 7082 | 0014 | 13bd | 0015 | 708a | 0014 | 1401 | 0000 | 0007 | 0014 | 1485 | 0000 | 0007 | 0200 | 0ddf | 0015 | 7072 | 0000 | 0007 | 0200 | 0ddf |
| 3304020 | 0015 | 707a | 0000 | 0007 | 0015 | 7091 | 0000 | 0007 | 0015 | 709d | 0000 | 0007 | 0200 | 0ddf | 0000 | 0007 | 0015 | 70aa | 0200 | 0ddf | 0000 | 0007 | 0015 | 70b2 |
| 3304100 | 0015 | 70b9 | 0000 | 0007 | 0015 | 70c5 | 0000 | 0007 | 0200 | 0ddf | 0000 | 0007 | 0015 | 70d2 | 0200 | 0ddf | 0000 | 0007 | 0015 | 70da | 0015 | 70e1 | 0000 | 0007 |
| 3304160 | 0015 | 70ed | 0000 | 0007 | 0200 | 0ddf | 0000 | 0007 | 0015 | 70fa | 0200 | 0ddf | 0000 | 0007 | 0015 | 7102 | 0015 | 7109 | 0000 | 0007 | 0015 | 7115 | 0000 | 0007 |
| 3304240 | 0200 | 0ddf | 0000 | 0007 | 0015 | 7122 | 0200 | 0ddf | 0000 | 0007 | 0015 | 712a | 0015 | 7131 | 0000 | 0007 | 0015 | 713d | 0000 | 0007 | 0200 | 0ddf | 0000 | 0007 |
| 3304320 | 0015 | 714a | 0200 | 0ddf | 0000 | 0007 | 0015 | 7152 | 0015 | 7159 | 0000 | 0007 | 0015 | 7165 | 0000 | 0007 | 0600 | 32df | 0000 | 03ab | 0014 | 7978 | 0014 | 797c |
| 3304400 | 0013 | 5b29 | 0014 | 1325 | 0014 | 7988 | 0300 | 2a87 | 0013 | 5b40 | 0015 | 7181 | 0013 | 5b48 | 0200 | 0df7 | 0015 | 7190 | 0015 | 719d | 0200 | 0ad7 | 0015 | 7194 |
| 3304460 | 0015 | 71ad | 0300 | 2a87 | 0013 | 5af9 | 0014 | 7971 | 0013 | 5b00 | 0200 | 0df7 | 0000 | 3387 | 0015 | 71c5 | 0200 | 0ad7 | 0015 | 7198 | 0015 | 71d5 | 0000 | 22cf |
| 3304540 | 0600 | 32df | 0000 | 01b3 | 0014 | 79a4 | 0014 | 79a8 | 0013 | 5a99 | 0014 | 13a9 | 0014 | 79b4 | 0300 | 2a87 | 0013 | 5ab0 | 0015 | 71f1 | 0013 | 5ab8 | 0200 | 0df7 |
| 3304620 | 0015 | 7200 | 0015 | 720d | 0200 | 0ad7 | 0015 | 7204 | 0015 | 721d | 0300 | 2a87 | 0013 | 5a68 | 0014 | 799d | 0013 | 5a70 | 0200 | 0df7 | 0000 | 3387 | 0015 | 7235 |
| 3304700 | 0200 | 0ad7 | 0015 | 7208 | 0015 | 7245 | 0000 | 22cf | 0200 | 0ddf | 0000 | 0007 | 0015 | 64aa | 0200 | 0ddf | 0000 | 0007 | 0015 | 6482 | 0200 | 0ddf | 0000 | 0007 |
| 3304760 | 0015 | 645a | 0200 | 0ddf | 0000 | 0007 | 0015 | 6432 | 0200 | 0ddf | 0000 | 0007 | 0015 | 640a | 0200 | 0ddf | 0015 | 6362 | 0000 | 0007 | 0014 | 1441 | 0015 | 72b2 |
| 3305040 | 0014 | 14c5 | 0015 | 72ba | 0014 | 1509 | 0015 | 72c2 | 0014 | 1549 | 0015 | 72ca | 0014 | 158d | 0015 | 72d2 | 0014 | 15cd | 0015 | 72da | 0014 | 1611 | 0015 | 72ea |
| 3305120 | 0014 | 1651 | 0015 | 72f2 | 0014 | 1695 | 0000 | 0007 | 0014 | 16d5 | 0015 | 72fa | 0014 | 1719 | 0015 | 7302 | 0014 | 1759 | 0015 | 730a | 0014 | 179d | 0015 | 7312 |
| 3305200 | 0014 | 17dd | 0015 | 731a | 0014 | 1821 | 0015 | 7322 | 0014 | 18a5 | 0000 | 0007 | 0200 | 0ddf | 0015 | 72aa | 0000 | 0007 | 0200 | 0ddf | 0015 | 72e2 | 0000 | 0007 |

```
3305260 0015 7329 0000 0007 0015 7335 0000 0007 0200 0ddf 0000 0007 0015 7342 0200 0ddf 0000 0007 0015 734a 0015 7351 0000 0007
3305340 0015 735d 0000 0007 0200 0ddf 0000 0007 0015 736a 0200 0ddf 0000 0007 0015 7372 0015 7379 0000 0007 0015 7385 0000 0007
3305420 0200 0ddf 0000 0007 0015 7392 0200 0ddf 0000 0007 0015 739a 0015 73a1 0000 0007 0015 73ad 0000 0007 0200 0ddf 0000 0007
3305500 0015 73ba 0200 0ddf 0000 0007 0015 73c2 0015 73c9 0000 0007 0015 73d5 0000 0007 0200 0ddf 0000 0007 0015 73e2 0200 0ddf
3305560 0000 0007 0015 73ea 0015 73f1 0000 0007 0015 73fd 0000 0007 0200 0ddf 0000 0007 0015 73e2 0200 0ddf 0000 0007 0015 73ba
3305640 0200 0ddf 0000 0007 0015 7392 0200 0ddf 0000 0007 0015 736a 0200 0ddf 0000 0007 0015 7342 0200 0ddf 0015 72aa 0000 0007
3305720 0014 1441 0015 746a 0014 14c5 0015 7472 0014 1509 0015 7482 0014 1549 0015 748a 0014 158d 0000 0007 0014 15cd 0015 7492
3306000 0014 1611 0015 749a 0014 1695 0000 0007 0200 0ddf 0015 7462 0000 0007 0200 0ddf 0015 747a 0000 0007 0015 74a1 0000 0007
3306060 0015 74ad 0000 0007 0200 0ddf 0000 0007 0015 74ba 0200 0ddf 0000 0007 0015 74c2 0015 74c9 0000 0007 0015 74d5 0000 0007
3306140 0200 0ddf 0000 0007 0015 74e2 0200 0ddf 0000 0007 0015 74ea 0015 74f1 0000 0007 0015 74fd 0000 0007 0200 0ddf 0000 0007
3306220 0015 750a 0200 0ddf 0000 0007 0015 7512 0015 7519 0000 0007 0015 7525 0000 0007 0200 0ddf 0000 0007 0015 7532 0200 0ddf
3306300 0000 0007 0015 753a 0015 7541 0000 0007 0015 754d 0000 0007 0200 0ddf 0000 0007 0015 755a 0200 0ddf 0000 0007 0015 7562
3306360 0015 7569 0000 0007 0015 7575 0000 0007 0200 0ddf 0000 0007 0015 755a 0200 0ddf 0000 0007 0015 7532 0200 0ddf 0000 0007
3306440 0015 750a 0200 0ddf 0000 0007 0015 74e2 0200 0ddf 0000 0007 0015 74ba 0200 0ddf 0015 7462 0000 0007 0014 1441 0015 75ea
3306520 0014 14c5 0015 75f2 0014 1509 0000 0007 0014 158d 0000 0007 0200 0ddf 0015 75da 0000 0007 0200 0ddf 0015 75e2 0000 0007
3306600 0015 75f9 0000 0007 0015 7605 0000 0007 0200 0ddf 0000 0007 0015 7612 0200 0ddf 0000 0007 0015 761a 0015 7621 0000 0007
3306660 0015 762d 0000 0007 0200 0ddf 0000 0007 0015 763a 0200 0ddf 0000 0007 0015 7642 0015 7649 0000 0007 0015 7655 0000 0007
3306740 0200 0ddf 0000 0007 0015 7662 0200 0ddf 0000 0007 0015 766a 0015 7671 0000 0007 0015 767d 0000 0007 0200 0ddf 0000 0007
3307020 0015 768a 0200 0ddf 0000 0007 0015 7692 0015 7699 0000 0007 0015 76a5 0000 0007 0200 0ddf 0000 0007 0015 76b2 0200 0ddf
3307100 0000 0007 0015 76ba 0015 76c1 0000 0007 0015 76cd 0000 0007 0600 32df 0000 03bb 0014 79d0 0014 79d4 0013 5a09 0014 142d
3307160 0014 79e0 0300 2a87 0013 5a20 0015 76e9 0013 5a28 0200 0df7 0015 76f8 0015 7705 0200 0ad7 0015 76fc 0015 7715 0300 2a87
3307240 0013 59d8 0014 79c9 0013 59e0 0200 0df7 0000 3387 0015 772d 0200 0ad7 0015 7700 0015 773d 0000 22cf 0600 32df 0000 03c3
3307320 0014 79fc 0014 7a00 0013 5979 0014 14b1 0014 7a0c 0300 2a87 0013 5990 0015 7759 0013 5998 0200 0df7 0015 7768 0015 7775
3307400 0200 0ad7 0015 776c 0015 7785 0300 2a87 0013 5949 0014 79f5 0013 5950 0200 0df7 0000 3387 0015 779d 0200 0ad7 0015 7770
3307460 0015 77ad 0000 22cf 0200 0ddf 0000 0007 0015 7562 0200 0ddf 0000 0007 0015 753a 0200 0ddf 0000 0007 0015 7512 0200 0ddf
3307540 0000 0007 0015 74ea 0200 0ddf 0000 0007 0015 74c2 0200 0ddf 0015 747a 0000 0007 0014 1549 0015 7822 0014 15cd 0015 782a
3307620 0014 1611 0000 0007 0014 1695 0000 0007 0200 0ddf 0015 7812 0000 0007 0200 0ddf 0015 781a 0000 0007 0015 7831 0000 0007
3307700 0015 783d 0000 0007 0200 0ddf 0000 0007 0015 784a 0200 0ddf 0000 0007 0015 7852 0015 7859 0000 0007 0015 7865 0000 0007
3307760 0200 0ddf 0000 0007 0015 7872 0200 0ddf 0000 0007 0015 787a 0015 7881 0000 0007 0015 788d 0000 0007 0200 0ddf 0000 0007
3310040 0015 789a 0200 0ddf 0000 0007 0015 78a2 0015 78a9 0000 0007 0015 78b5 0000 0007 0200 0ddf 0000 0007 0015 78c2 0200 0ddf
3310120 0000 0007 0015 78ca 0015 78d1 0000 0007 0015 78dd 0000 0007 0200 0ddf 0000 0007 0015 78ea 0200 0ddf 0000 0007 0015 78f2
3310200 0015 78f9 0000 0007 0015 7905 0000 0007 0600 32df 0000 03cb 0014 7a28 0014 7a2c 0013 58e9 0014 1535 0014 7a38 0300 2a87
3310260 0013 5900 0015 7921 0013 5908 0200 0df7 0015 7930 0015 793d 0200 0ad7 0015 7934 0015 794d 0300 2a87 0013 58b8 0014 7a21
3310340 0013 58c0 0200 0df7 0000 3387 0015 7965 0200 0ad7 0015 7938 0015 7975 0000 22cf 0600 32df 0000 03d3 0014 7a54 0014 7a58
3310420 0013 5859 0014 15b9 0014 7a64 0300 2a87 0013 5870 0015 7991 0013 5878 0200 0df7 0015 79a0 0015 79ad 0200 0ad7 0015 79a4
3310500 0015 79bd 0300 2a87 0013 5828 0014 7a4d 0013 5830 0200 0df7 0000 3387 0015 79d5 0200 0ad7 0015 79a8 0015 79e5 0000 22cf
3310560 0200 0ddf 0000 0007 0015 73ea 0200 0ddf 0000 0007 0015 73c2 0200 0ddf 0000 0007 0015 739a 0200 0ddf 0000 0007 0015 7372
3310640 0200 0ddf 0000 0007 0015 734a 0200 0ddf 0015 72e2 0000 0007 0014 1651 0015 7a52 0014 16d5 0015 7a5a 0014 1719 0015 7a6a
3310720 0014 1759 0015 7a72 0014 179d 0000 0007 0014 17dd 0015 7a7a 0014 1821 0015 7a82 0014 18a5 0000 0007 0200 0ddf 0015 7a4a
3311000 0000 0007 0200 0ddf 0015 7a62 0000 0007 0015 7a89 0000 0007 0015 7a95 0000 0007 0200 0ddf 0000 0007 0015 7aa2 0200 0ddf
3311060 0000 0007 0015 7aaa 0015 7ab1 0000 0007 0015 7abd 0000 0007 0200 0ddf 0000 0007 0015 7aca 0200 0ddf 0000 0007 0015 7ad2
3311140 0015 7ad9 0000 0007 0015 7ae5 0000 0007 0200 0ddf 0000 0007 0015 7af2 0200 0ddf 0000 0007 0015 7afa 0015 7b01 0000 0007
3311220 0015 7b0d 0000 0007 0200 0ddf 0000 0007 0015 7b1a 0200 0ddf 0000 0007 0015 7b22 0015 7b29 0000 0007 0015 7b35 0000 0007
3311300 0200 0ddf 0000 0007 0015 7b42 0200 0ddf 0000 0007 0015 7b4a 0015 7b51 0000 0007 0015 7b5d 0000 0007 0200 0ddf 0000 0007
3311360 0015 7b42 0200 0ddf 0000 0007 0015 7b1a 0200 0ddf 0000 0007 0015 7af2 0200 0ddf 0000 0007 0015 7aca 0200 0ddf 0000 0007
3311440 0015 7aa2 0200 0ddf 0015 7a4a 0000 0007 0014 1651 0015 7bd2 0014 16d5 0015 7bda 0014 1719 0000 0007 0014 179d 0000 0007
3311520 0200 0ddf 0015 7bc2 0000 0007 0200 0ddf 0015 7bca 0000 0007 0015 7be1 0000 0007 0015 7bed 0000 0007 0200 0ddf 0000 0007
3311600 0015 7bfa 0200 0ddf 0000 0007 0015 7c02 0015 7c09 0000 0007 0015 7c15 0000 0007 0200 0ddf 0000 0007 0015 7c22 0200 0ddf
3311660 0000 0007 0015 7c2a 0015 7c31 0000 0007 0015 7c3d 0000 0007 0200 0ddf 0000 0007 0015 7c4a 0200 0ddf 0000 0007 0015 7c52
3311740 0015 7c59 0000 0007 0015 7c65 0000 0007 0200 0ddf 0000 0007 0015 7c72 0200 0ddf 0000 0007 0015 7c7a 0015 7c81 0000 0007
3312020 0015 7c8d 0000 0007 0200 0ddf 0000 0007 0015 7c9a 0200 0ddf 0000 0007 0015 7ca2 0015 7ca9 0000 0007 0015 7cb5 0000 0007
3312100 0600 32df 0000 03db 0014 7a80 0014 7a84 0013 57c9 0014 163d 0014 7a90 0300 2a87 0013 57e0 0015 7cd1 0013 57e8 0200 0df7
3312160 0015 7ce0 0015 7ced 0200 0ad7 0015 7ce4 0015 7cfd 0300 2a87 0013 5798 0014 7a79 0013 57a0 0200 0df7 0000 3387 0015 7d15
3312240 0200 0ad7 0015 7ce8 0015 7d25 0000 22cf 0600 32df 0000 03e3 0014 7aac 0014 7ab0 0013 5739 0014 16c1 0014 7abc 0300 2a87
3312320 0013 5750 0015 7d41 0013 5758 0200 0df7 0015 7d50 0015 7d5d 0200 0ad7 0015 7d54 0015 7d6d 0300 2a87 0013 5708 0014 7aa5
```

```
3312400 0013 5710 0200 0df7 0000 3387 0015 7d85 0200 0a47 0015 7d58 0015 7d95 0000 22cf 0200 0ddf 0000 0007 0015 7b4a 0200 0ddf
3312460 0000 0007 0015 7b22 0200 0ddf 0000 0007 0015 7afa 0200 0ddf 0000 0007 0015 7ad2 0200 0ddf 0000 0007 0015 7aaa 0200 0ddf
3312540 0015 7a62 0000 0007 0014 1759 0015 7e0a 0014 17dd 0015 7e12 0014 1821 0000 0007 0014 18a5 0000 0007 0200 0ddf 0015 7dfa
3312620 0000 0007 0200 0ddf 0015 7e02 0000 0007 0015 7e19 0000 0007 0015 7e25 0000 0007 0200 0ddf 0000 0007 0015 7e32 0200 0ddf
3312700 0000 0007 0015 7e3a 0015 7e41 0000 0007 0015 7e4d 0000 0007 0200 0ddf 0000 0007 0015 7e5a 0200 0ddf 0000 0007 0015 7e62
3312760 0015 7e69 0000 0007 0015 7e75 0000 0007 0200 0ddf 0000 0007 0015 7e82 0200 0ddf 0000 0007 0015 7e8a 0015 7e91 0000 0007
3313040 0015 7e9d 0000 0007 0200 0ddf 0000 0007 0015 7eaa 0200 0ddf 0000 0007 0015 7eb2 0015 7eb9 0000 0007 0015 7ec5 0000 0007
3313120 0200 0ddf 0000 0007 0015 7ed2 0200 0ddf 0000 0007 0015 7eda 0015 7ee1 0000 0007 0015 7eed 0000 0007 0600 32df 0000 03eb
3313200 0014 7ad8 0014 7adc 0013 56a9 0014 1745 0014 7ae8 0300 2a87 0013 56c0 0015 7f09 0013 56c8 0200 0df7 0015 7f18 0015 7f25
3313260 0200 0ad7 0015 7f1c 0015 7f35 0300 2a97 0013 5678 0014 7ad1 0013 5680 0200 0df7 0000 3387 0015 7f4d 0200 0ad7 0015 7f20
3313340 0015 7f5d 0000 22cf 0600 32df 0000 03f3 0014 7b04 0014 7b08 0013 5619 0014 17c9 0014 7b14 0300 2a87 0013 5630 0015 7f79
3313420 0013 5638 0200 0df7 0015 7f88 0015 7f95 0200 0ad7 0015 7f8c 0015 7fa5 0300 2a87 0013 55e8 0014 7afd 0013 55f0 0200 0df7
3313500 0000 3387 0015 7fbd 0200 0ad7 0015 7f90 0015 7fcd 0000 22cf 0200 0ddf 0000 0007 0014 a49a 0200 0ddf 0000 0007 0014 a472
3313560 0200 0ddf 0000 0007 0014 a44a 0200 0ddf 0000 0007 0014 a422 0200 0ddf 0000 0007 0014 a3fa 0200 0ddf 0014 9a7e 0014 a3d2
3313640 0014 1861 0015 803a 0014 1929 0000 0007 0200 0ddf 0014 9ab2 0014 a3aa 0014 1a85 0015 8056 0014 1b09 0015 805e 0014 1b4d
3313720 0015 8066 0014 1b81 0015 806e 0014 1b11 0015 8076 0014 1c11 0015 807e 0014 1c55 0015 8086 0014 1c95 0015 808e 0014 1cd9
3314000 0015 8096 0014 1d19 0015 809e 0014 1d5d 0015 80a6 0014 1d9d 0015 80ae 0014 1de1 0015 80b6 0014 1e21 0015 80be 0014 1e65
3314060 0015 80c6 0014 1ea5 0015 80ce 0014 1ee9 0015 80d6 0014 1f29 0015 80de 0014 1f6d 0015 80e6 0014 1fad 0015 80ee 0014 1ff1
3314140 0015 80f6 0014 2031 0015 80fe 0014 2075 0015 8106 0014 20b5 0015 810e 0014 20f9 0015 8116 0014 2139 0015 811e 0014 217d
3314220 0015 8126 0014 21bd 0015 812e 0014 2201 0015 8136 0014 2241 0015 813e 0014 2285 0015 8146 0014 22c5 0015 814e 0014 2309
3314300 0015 8156 0014 2349 0015 815e 0014 238d 0015 8166 0014 23cd 0015 816e 0014 2411 0015 8176 0014 2451 0015 817e 0014 2495
3314360 0015 8186 0014 24d5 0015 818e 0014 2519 0015 8196 0014 259d 0000 0007 0200 0ddf 0014 9c1e 0014 a382 0014 26f9 0015 81b2
3314440 0014 277d 0015 81ba 0014 27c1 0015 81c2 0014 2801 0015 81ca 0014 2845 0015 81d2 0014 2885 0015 81da 0014 28c9 0015 81e2
3314520 0014 2909 0015 81ea 0014 294d 0015 81f2 0014 298d 0015 81fa 0014 29d1 0015 8202 0014 2a11 0015 820a 0014 2a55 0015 8212
3314600 0014 2a95 0015 821a 0014 2ad9 0015 8222 0014 2b19 0015 822a 0014 2b5d 0015 8232 0014 2b9d 0015 823a 0014 2be1 0015 8242
3314660 0014 2c21 0015 824a 0014 2c65 0015 8252 0014 2ca5 0015 825a 0014 2ce9 0015 8262 0014 2d29 0015 826a 0014 2d6d 0015 8272
3314740 0014 2dad 0015 827a 0014 2df1 0015 8282 0014 2e31 0015 828a 0014 2e75 0015 8292 0014 2eb5 0015 829a 0014 2ef9 0015 82a2
3315020 0014 2f39 0015 82aa 0014 2f7d 001b 2240 2823 2938 392f 3038 2f32 3820 6461 7465 2e70 6c09 3333 2e32 2200 3085 000a 2568
3315100 0100 2def 0000 70af 0000 0004 0015 8314 0015 8314 0001 0076 0000 0000 0000 0028 0014 7d1c b27c b66c 0000 0ed5 7fff ffff
3315160 0016 1e38 0200 0db5 0100 32b5 0000 70af 0000 315f 2cac 3435 0002 438a 2ca0 3475 0000 0000 0000 0001 0014 8c84 0014 8c84
3315240 0002 438a 000b 13a0 0015 60c4 0900 70af 0000 70af 0000 0024 0014 4404 0014 4404 0001 0076 0000 0000 2cac 835e 0002 438a
3315320 2ca0 8366 0000 0000 0000 0001 0014 3b5c 0014 3b5c 0002 438a 0011 3674 0012 41b8 0800 53c7 0000 70af 0000 0020 0014 439c
3315400 0014 439c 0001 0076 0000 0000 2cac 3895 0002 438a 2ca0 38d9 0000 0000 0000 0001 0014 3bd8 0014 3bd8 0002 438a 0011 36b4
3315460 2cac 83c6 0002 438a 2ca0 83ce 0000 0000 0000 0001 0014 3d0c 0014 3d0c 0002 438a 000b 4874 2cac 3ae9 0002 438a 2ca0 3b29
3315540 0000 0000 0000 0001 0014 3489 0014 3d88 0002 438a 000b 4780 2cac 840e 0002 438a 2ca0 8416 0000 0000 0000 0001 0014 3e84
3315620 0014 3e84 0002 438a 000b 49e0 2cac 3d39 0002 438a 2ca0 317d 0000 0000 0000 0001 0014 3efc 0014 3efc 0002 438a 0011 3718
3315700 2cac 0007 0002 438a 2ca0 9ef6 0000 0000 0000 0001 0014 3fc4 0014 3fc4 0002 438a 000b 37bc 2cac 847a 0002 438a 2ca0 8482
3315760 0000 0000 0000 0001 0014 40c4 0014 40c4 0002 438a 000b 4050 0015 6284 0200 70ff 0000 70af 0000 0008 0015 85b4 0015 85b4
3316040 0001 0076 0000 0000 2cac 42f9 0002 438a 2ca0 433d 0000 0000 0000 0001 0014 41a0 0014 41a0 0002 438a 0015 84dc 0014 41ac
3316120 2cac 4445 0002 438a 2ca0 4485 0000 0000 0000 0001 0014 4220 0014 4220 0002 438a 0015 8504 0014 422c 2cac 458d 0002 438a
3316200 2ca0 45d1 0000 0000 0000 0001 0014 42f0 0014 42f0 0002 438a 0015 852c 0014 42fc 0012 08a8 0a00 7117 0000 70af 0000 0028
3316260 0014 4cc4 0014 4cc4 0021 0000 0000 0000 0012 08c8 0b00 711f 0000 70af 0000 002c 0015 87a8 0015 87a8 0021 0000 0000 0000
3316340 0012 0928 0900 7127 0000 70af 0000 0024 0014 4c90 0014 4c90 0021 0000 0000 0000 2cac 49f1 0002 438a 2ca0 4a31 0000 000c
3316420 0000 0004 0014 4544 0014 4670 0002 438a 0014 83ac 2cac 4550 0002 438a 2ca0 4c55 0000 000c 0000 0003 000a fe30 0015 8614
3316500 0002 438a 0014 828c 0016 b5dc 28c4 0018 0015 8614 5d10 0000 0300 70df 5f78 50f0 0000 7137 001d 2568 3a25 3032 693a 2530
3316560 3273 2025 3141 4420 2564 2d25 334d 2d25 3032 7900 2954 001c 0002 438a 5d10 0000 0600 70af 5fb4 0018 52c4 0000 0000 713f
3316640 0014 8b88 0200 22df 0000 70af 0000 0008 000a 18f0 000a 18f0 0000 0000 0000 0000 0014 8c10 0000 0024 2ca0 865e 0000 0000
3316720 0000 0001 0014 4814 0014 4814 0002 438a 0015 85d8 0014 8c58 0200 22d7 0000 70af 0000 0008 000a 18f0 000a 18f0 0000 0000
3317000 0000 0000 0015 8654 0000 0024 2ca0 53d1 0000 000c 0000 0004 0014 4888 0014 4ad4 0002 438a 0014 8168 000f 4df8 0000 0000
3317060 0015 8674 0300 22d7 0000 70af 0000 000c 000a 18f0 000a 18f0 0000 0000 0000 0000 0015 ad68 0010 6368 6970 7369 7a65 725f
3317140 7265 706f 7274 0000 0000 002c 0013 c3b8 b27c b66c 0000 0eee 7fff ffff 0015 872c 0200 0db5 0200 22ed 0000 711f 00ac 4003
3317220 0000 315f 0000 002c 0015 8700 b27c b66c 0000 0eef 7fff ffff 0015 8758 0200 0db5 0200 22ed 0000 7127 00ac 6b03 0000 315f
3317300 0000 002c 0015 872c b27c b66c 0000 0ef0 7fff ffff 0015 8784 0200 0db5 0200 22ed 0000 7117 00ac 4ec3 0000 315f 0000 002c
3317360 0015 8758 b27c b66c 0000 0ef1 7fff ffff 0016 be08 0200 0db5 0200 22ed 0000 714f 00ac 8fa3 0000 315f 2c78 004a 0002 438a
3317440 7ae4 001c 7ed4 7ed4 7ed4 7ed4 7ed4 7ed4 7ed4 813c 8130 8124 7ebc 0000 0015 8800 0028 8924 0030 8900 891c 0018 891c 001c
```

| | | | | | | | | | | | | | | | | | | | | | | | | |
|---|---|---|---|---|---|---|---|---|---|---|---|---|---|---|---|---|---|---|---|---|---|---|---|---|
| 3317520 | 991c | 0020 | 891c | 0024 | 891c | 0028 | 891c | 002c | 228c | 87f6 | b464 | 3f30 | 0014 | 4d3c | 0017 | 7b04 | 9de3 | bf98 | 808e | 2002 | 2280 | 0006 | b32e | 6010 |
| 3317600 | 4000 | 0562 | 9010 | 2000 | 1080 | 0003 | b210 | 0008 | b216 | 401a | 808e | 2001 | 0200 | 0006 | f227 | bffc | 4000 | 044d | 9007 | bffc | 1080 | 0005 | b210 | 0008 |
| 3317660 | 4000 | 0495 | 9007 | bffc | b210 | 0008 | 8090 | 0019 | 3280 | 0005 | d606 | 6014 | 1500 | 0295 | 1080 | 0014 | f202 | a1c8 | d626 | c000 | da06 | 6010 | d827 | 0000 |
| 3317740 | da06 | 600c | da27 | 4000 | de07 | a05c | e006 | 6018 | e023 | c000 | e207 | a060 | e406 | 6008 | e424 | 4000 | e607 | a064 | e806 | 6004 | e824 | c000 | ea07 | a068 |
| 3320020 | f206 | 4000 | f225 | 4000 | b210 | 2000 | 81c7 | e008 | 91e8 | 0019 | 9de3 | bf90 | b006 | 276c | 8090 | 0018 | 3480 | 0004 | 80a6 | 6001 | b006 | 2001 | 80a6 | 6001 |
| 3320100 | 2480 | 0005 | ba06 | 600e | b810 | 0018 | 1080 | 0003 | ba06 | 6002 | b826 | 2001 | 1900 | 0568 | c11b | 22b8 | fa23 | a060 | c503 | a060 | 89a0 | 1902 | 1f00 | 0568 |
| 3320160 | b12e | 2002 | ad2e | 2001 | b006 | 0016 | b006 | 0019 | b72e | 2005 | 8da0 | 0944 | b020 | 0018 | b006 | 001b | 1300 | 023e | 9212 | 63fe | b006 | 001a | 2700 | 0690 |
| 3320240 | a614 | e2a3 | 80a6 | 0009 | 8fa0 | 1a46 | cf23 | a064 | da03 | a064 | d11b | e2c0 | f823 | a068 | d503 | a068 | 99a0 | 190a | 9da2 | 094c | 9fa0 | 1a4e | df23 | a06c |
| 3320320 | fa03 | a06c | ba07 | 400d | ba07 | 401a | 0680 | 000f | ba07 | 4013 | 9210 | 2064 | 7ffe | 65a8 | 9010 | 001c | b010 | 0008 | 9410 | 0018 | 8090 | 000a | 3680 | 0004 |
| 3320400 | ba07 | 6002 | 9402 | a003 | ba07 | 6002 | ba27 | 4018 | 953a | a002 | ba07 | 400a | 81c7 | e008 | 91e8 | 001d | 9de3 | bfa0 | 9010 | 0018 | 9210 | 0019 | 7fff | ffbe |
| 3320460 | 9410 | 001a | 9002 | 2001 | 7fff | c6c2 | 9210 | 2007 | 81c7 | e008 | 91e8 | 0008 | 9de3 | bf98 | 8090 | 0018 | 0680 | 0018 | 80a6 | 20c8 | 1480 | 0016 | 8090 | 0019 |
| 3320540 | 0680 | 0014 | 80a6 | 600b | 1480 | 0012 | 80a6 | a001 | 0680 | 0010 | 80a6 | a01f | 1480 | 000e | 8090 | 001b | 0680 | 000c | 80a6 | e017 | 1480 | 000a | 8090 | 001c |
| 3320620 | 0680 | 0008 | 80a7 | 203b | 1480 | 0006 | 8090 | 001d | 0680 | 0004 | 80a7 | 603b | 2480 | 0004 | 9410 | 001a | 1080 | 004f | b010 | 2016 | 9210 | 0019 | 7fff | ff9a |
| 3320700 | 9010 | 0018 | e607 | a064 | 1300 | 094f | 9212 | 618c | 9022 | 0009 | 912a | 2003 | 992a | 2001 | 9002 | 000c | 9002 | 001b | 912a | 2002 | 9f2a | 2004 | 9020 | 0008 |
| 3320760 | 9002 | 000f | 9002 | 001c | 912a | 2002 | a12a | 2004 | 9020 | 0008 | 9002 | 0011 | 9002 | 001d | 8090 | 0013 | 0280 | 002b | d027 | bffc | 4000 | 03af | 9007 | bffc |
| 3321040 | b210 | 0008 | 8090 | 0019 | 3280 | 0005 | f006 | 600c | 2900 | 0295 | 1080 | 002e | f005 | 21c8 | b026 | 8018 | 80a6 | 2001 | 2480 | 0004 | 80a6 | 3fff | 1080 | 0005 |
| 3321120 | b010 | 3fff | 3690 | 0004 | d406 | 6008 | b010 | 2001 | d406 | 6008 | de06 | 6004 | f206 | 4000 | ea07 | bffc | b12e | 2003 | 912e | 2001 | b006 | 0008 | b006 | 001b |
| 3321200 | b026 | 000a | b12e | 2002 | 992e | 2004 | b020 | 0018 | b006 | 000c | b006 | 001c | b026 | 000f | b12e | 2002 | a32e | 2004 | b020 | 0018 | b006 | 0011 | b006 | 001d |
| 3321260 | b026 | 0019 | aa05 | 4018 | ea27 | bffc | ec07 | bffc | 1207 | a060 | 1900 | 003f | 9813 | 23ff | ac0d | 800c | ec22 | 4000 | d407 | bffc | de07 | a05c | 953a | a010 |
| 3321340 | 940a | 800c | d423 | c000 | b010 | 2000 | 81c7 | e008 | 91e8 | 0000 | d84a | 0000 | 9803 | 000a | d82a | c000 | 9002 | 2001 | da4a | 0000 | 8090 | 000d | 9222 | 6001 |
| 3321420 | 0280 | 000d | 9602 | e001 | 8090 | 0009 | 2280 | 000b | 92a2 | 6001 | c24a | 0000 | c22a | c000 | 9002 | 2001 | da4a | 0000 | 8090 | 000d | 9222 | 6001 | 12bf | fff7 |
| 3321500 | 9602 | e001 | 92a2 | 6001 | 0c80 | 0007 | 0100 | 0000 | 8410 | 2020 | c42a | c000 | 92a2 | 6001 | 1cbf | fffd | 9602 | e001 | 81c3 | e008 | 9000 | 000b | 9de3 | bfa0 |
| 3321560 | 9010 | 0018 | 7fff | c633 | 9210 | 200a | ba10 | 0008 | 9010 | 0018 | 7fff | c62f | 9210 | 2064 | 7ffe | 64ff | 9210 | 200a | 80a2 | 2001 | 2280 | 0009 | 1100 | 0568 |
| 3321640 | 8090 | 001d | 2280 | 0006 | 1100 | 0568 | 80a7 | 6003 | 2480 | 0005 | 80a7 | 6001 | 1100 | 0568 | 1080 | 000d | ba02 | 2395 | 3280 | 0005 | 80a7 | 6002 | 1300 | 0568 |
| 3321720 | 1080 | 0008 | ba02 | 6398 | 3280 | 0005 | 1700 | 0560 | 1500 | 0568 | 1080 | 0003 | ba02 | a39b | ba02 | e39e | d84f | 4000 | ba07 | 6001 | d82e | 4000 | fa4f | 4000 |
| 3322000 | b206 | 6001 | fa2e | 4000 | b006 | 6001 | 81c7 | e008 | 91e8 | 0000 | 9de3 | bfa0 | 8090 | 0019 | 3280 | 000e | b606 | c019 | ba10 | 0018 | 80a7 | 600a | 0680 | 0009 |
| 3322060 | b210 | 2001 | 9210 | 200a | 7ffe | 64d4 | 9010 | 001d | ba10 | 0008 | 80a7 | 600a | 16bf | fffb | b206 | 6001 | b606 | c019 | ba10 | 001b | 9210 | 200a | 7fff | c5f9 |
| 3322140 | 9010 | 0018 | 9002 | 2030 | b626 | e001 | d02e | c000 | 9010 | 0018 | 7ffe | 64c5 | 9210 | 200a | b010 | 0008 | 8090 | 0018 | 0280 | 0005 | b226 | 6001 | 8090 | 0019 |
| 3322220 | 32bf | fff3 | 9210 | 200a | 80a6 | a030 | 2280 | 0004 | b2a6 | 6001 | b410 | 2020 | b2a6 | 6001 | b12e | a018 | 0c80 | 0006 | b13e | 2018 | b2a6 | 6001 | b626 | e001 |
| 3322300 | 1cbf | fffe | f02e | c000 | 81c7 | e008 | 91e8 | 001d | 9de3 | b120 | f227 | a048 | b207 | bd9c | 8090 | 0018 | a607 | bf9c | 0280 | 0006 | f227 | bd80 | d44e | 0000 |
| 3322360 | 8090 | 000a | 3280 | 0005 | 80a7 | 600c | 1700 | 0568 | b002 | e3a1 | 80a7 | 600c | 1480 | 000d | ae10 | 0018 | 80a7 | 600c | 3280 | 000b | b010 | 2000 | d807 | a05c |
| 3322440 | 8090 | 000c | 1280 | 0006 | 0100 | 0000 | da07 | a060 | 8090 | 000d | 2280 | 0003 | b010 | 2000 | b010 | 2001 | e407 | a048 | 1500 | 0568 | 9412 | a26c | 932e | a002 |
| 3322520 | 9202 | 400a | 1900 | 0568 | d227 | bd98 | 9813 | 2250 | d827 | bd94 | 9210 | 200c | 7fff | c5b6 | 9007 | 600b | 9002 | 2001 | d027 | bd90 | 9006 | 2004 | 1f00 | 0568 |
| 3322600 | 9e13 | e29c | 972e | 2002 | b006 | 2002 | b12e | 2002 | 912a | 2002 | 9002 | 000f | b006 | 000f | 9602 | c00f | 80a6 | 4013 | a006 | a001 | a204 | a76c | d027 | bd8c |
| 3322660 | f027 | bd84 | 1a80 | 00e6 | d627 | bd88 | b010 | 0017 | f04e | 000c | ae05 | e001 | 8090 | 0018 | 2280 | 00e1 | c02e | 4000 | 80a6 | 2025 | 2280 | 0005 | ec4d | c000 |
| 3322740 | f02e | 4000 | 1080 | 00d7 | b206 | 6001 | a810 | 0017 | 9a25 | a030 | 80a3 | 600a | b010 | 2000 | 1a80 | 000d | ae05 | e001 | b12e | 2001 | 932e | 2002 | b006 | 0009 |
| 3323020 | b026 | 2030 | b006 | 0016 | ec4d | c000 | ae05 | e001 | 9a25 | a030 | 80a3 | 600a | 2abf | fff8 | b12e | 2001 | 80a6 | 2063 | 2480 | 0004 | 9025 | a041 | b010 | 2063 |
| 3323100 | 9025 | a041 | 80a2 | 2038 | 1880 | 00bc | 1500 | 0563 | 9332 | 2005 | 9202 | 4008 | 9810 | 201f | 920a | 400c | 932a | 6003 | 9412 | a318 | d602 | 400a | 80a2 | c008 |
| 3323160 | 3280 | 00b3 | ec2e | 4000 | 9202 | 400a | d002 | 6004 | 91c2 | 0000 | c100 | 0000 | 0000 | 0000 | 0015 | 9168 | 0000 | 0020 | 0015 | 9168 | ffff | ffff | 0015 | 91c8 |
| 3323240 | 0000 | 0022 | 0015 | 9114 | 0000 | 0023 | 0015 | 9050 | ffff | ffff | 0015 | 91c8 | ffff | ffff | 0015 | 91c8 | ffff | ffff | 0015 | 91c8 | 0000 | 0027 | 0015 | 90f8 |
| 3323320 | 0000 | 0028 | 0015 | 9130 | ffff | ffff | 0015 | 91c8 | ffff | ffff | 0015 | 91c8 | 0000 | 000c | 0015 | 9094 | 0000 | 002c | 0015 | 9094 | 0000 | 002d | 0015 | 9034 |
| 3323400 | 0000 | 000f | 0015 | 91a8 | 0000 | 002f | 0015 | 9188 | ffff | ffff | 0015 | 91c8 | ffff | ffff | 0015 | 91c8 | 0000 | 0032 | 0015 | 914c | 0000 | 0033 | 0015 | 906c |
| 3323460 | ffff | ffff | 0015 | 91c8 | 0000 | 0016 | 0015 | 90b4 | 0000 | 0036 | 0015 | 90b4 | ffff | ffff | 0015 | 91c8 | 0000 | 0039 | 0015 | 9018 | ffff | ffff | 0015 | 91c8 |
| 3323540 | ffff | ffff | 0015 | 91c8 | ffff | ffff | 0015 | 91c8 | ffff | ffff | 0015 | 91c8 | ffff | ffff | 0015 | 91c8 | ffff | ffff | 0015 | 91c8 | d44d | 0000 | 9610 | 0019 |
| 3323620 | 9010 | 0011 | 7fff | ff20 | 9210 | 0018 | 1080 | 0069 | b210 | 0008 | d44d | 0000 | 9610 | 0019 | 9010 | 0010 | 7fff | ff19 | 9210 | 0018 | 1080 | 0062 | b210 | 0008 |
| 3323700 | d44d | 0000 | 9610 | 0019 | 9010 | 001b | 7fff | ff12 | 9210 | 0018 | 1080 | 005b | b210 | 0008 | d44d | 0000 | 9610 | 0019 | 9010 | 001b | 7fff | ff0b | 9210 | 0018 |
| 3323760 | 9210 | 0008 | 7fff | fede | 9010 | 001b | 1080 | 0051 | b210 | 0008 | d007 | bd98 | 9610 | 0019 | d002 | 0000 | 9210 | 0018 | 7fff | fe08 | 9425 | a04d | 1080 | 0049 |
| 3324040 | b210 | 0008 | 8090 | 001c | 3680 | 0008 | d007 | bd94 | 9410 | 001b | 9210 | 001a | 7fff | fe3a | 9010 | 0012 | b810 | 0008 | d007 | bd94 | 9b2f | 2002 | d003 | 4008 |
| 3324120 | 9610 | 0019 | 9210 | 0018 | 7fff | fea7 | 9425 | a057 | 1080 | 0038 | b210 | 0008 | d007 | bd90 | d44d | 0000 | 9610 | 0019 | 7fff | fee8 | 9210 | 0018 | 1080 | 0031 |
| 3324200 | b210 | 0008 | d44d | c000 | 9610 | 0019 | 9010 | 001d | 7fff | fee1 | 9210 | 0019 | 1080 | 002a | b210 | 0008 | d007 | a05c | d44d | 0000 | 9610 | 0019 | 7fff | feda |
| 3324260 | 9210 | 0018 | 1080 | 0023 | b210 | 0008 | d007 | a06c | d44d | 0000 | 9610 | 0019 | 7fff | fed3 | 9210 | 0018 | 1080 | 001c | b210 | 0008 | d007 | bd8c | 9610 | 0019 |
| 3324340 | d002 | 0000 | 9210 | 0018 | 7fff | fe83 | 9425 | a061 | 1080 | 0014 | b210 | 0008 | d007 | bd88 | 9610 | 0019 | d002 | 0000 | 9410 | 2000 | 7fff | fe7b | 9210 | 0018 |
| 3324420 | 1080 | 000c | b210 | 0008 | d007 | bd84 | 9610 | 0019 | d002 | 0000 | 9410 | 2000 | 7fff | fe73 | 9210 | 0018 | 1080 | 0004 | b210 | 0008 | ec2e | 4000 | b206 | 6001 |
| 3324500 | 80a6 | 4013 | 2abf | ff1f | b010 | 0017 | c02e | 400c | c02c | c000 | 7ffb | 1782 | d007 | bd80 | 81c7 | e008 | 91e8 | 0008 | 9de3 | bfa0 | 912e | e010 | 9002 | 001c |
| 3324560 | 7ffe | 6432 | 9210 | 001a | de07 | a05c | b12e | 2010 | b002 | 0018 | 1100 | 003f | 9012 | 23ff | b006 | 0019 | 980e | 0008 | b13e | 2010 | b00e | 0008 | d823 | c000 |

```
3324640 f027 4000 81c7 e008 81e8 0000 0000 0000 9a10 2000 9810 2000 d24a 000d 9a03 6001 80a3 6004 920a 60ff 992b 2008 06bf fffb
3324720 9813 0009 81c3 e008 9000 000c 033f fff6 8200 63a0 9de3 8001 1100 0569 fa02 2058 8090 001d 3280 000d 8090 0018 9210 201c
3325000 7ffa f7fe 9010 2001 ba10 0008 8090 001d 3280 0004 1300 0569 1080 014f ba10 3fff fa22 6058 8090 0018 3280 0009 d64e 0000
3325060 1500 0569 b002 a028 8090 0018 3280 0004 d64e 0000 1080 0144 ba10 3fff 80a2 e02f 3280 0003 9a10 2000 9a10 2001 b810 000d
3325140 8090 001c 3280 002d 8090 001c 1f00 0569 b603 e032 8090 001b 2280 0137 ba10 3fff 7fff e240 9010 0018 b210 0008 7fff e23d
3325220 9010 001b 9002 0019 9002 2001 80a2 2400 2680 0004 b407 bc00 1080 012b ba10 3fff 9010 001a 4000 02c3 9210 001b 1300 0569
3325300 9212 604a 4000 0283 9010 001a 9010 001a 4000 0280 9210 0018 e64e 0000 8090 0013 2280 000d b010 001a ea4e 0000 b006 2001
3325360 80a5 602e 3280 0004 e64e 0000 b810 2001 e64e 0000 8090 0013 32bf fff9 ea4e 0000 b010 001a 8090 001c 2280 000a 9210 2000
3325440 9210 2004 4000 0289 9010 0018 8090 0008 2280 0004 9210 2000 1080 0107 ba10 3fff 7ffd e282 9010 0018 b010 0008 80a6 3fff
3325520 3280 0004 2f3f fff7 1080 00ff ba10 3fff 9207 8017 1500 0008 4000 020c 9010 0018 b810 0008 7ffd e261 9010 0018 8090 0008
3325600 1280 0004 80a7 202c 3680 0004 333f fff7 1080 00f1 ba10 3fff b007 8019 7fff ff85 9006 2020 d027 4000 7fff ff82 9006 2024
3325660 d027 6004 7fff ff7f 9006 2028 d027 6008 d207 4000 80a2 6172 1480 000e 0100 0000 d407 6004 8090 000a 0280 000a 0100 0000
3325740 d607 6004 80a2 e100 1490 0006 0100 0000 d807 6008 80a3 2032 2480 0004 da07 6004 1080 00d5 ba10 3fff e007 4000 e807 6008
3326020 a32c 2002 9b2b 6001 9f2b 6001 a004 0011 a004 202c 9a03 400f a004 000d a004 0014 80a7 0010 3680 0004 ec07 600c 1080 00c6
3326100 ba10 3fff 8090 0016 2280 0005 ee07 6010 7ffa f626 d007 600c ee07 6010 8090 0017 2280 0005 f207 6014 7ffa f620 d007 6010
3326160 f207 6014 8090 0019 2280 0005 d007 4000 7ffa f61a d007 6014 d007 4000 8090 0008 3280 001a d007 4000 c027 600c c027 6010
3326240 d007 6004 7ffa f755 9210 200c d027 6014 d607 6014 8090 000b 3280 0024 d007 6008 d807 600c 8090 000c 2280 0005 da07 6010
3326320 7ffa f606 d007 600c da07 6010 8090 000d 0280 0004 0100 0000 7ffa f600 d007 6010 1080 0099 ba10 3fff 7ffa f740 9210 2004
3326400 d027 600c d207 600c 8090 0009 3280 0004 d007 4000 1080 0090 ba10 3fff 7ffa f737 9210 2001 d027 6010 d407 6010 8090 000a
3326460 32bf ffdd d007 6004 7ffa f5ec d007 600c 1080 0085 ba10 3fff 9210 2001 7ffa f72b 9002 2001 d027 6018 de07 6018 8090 000f
3326540 3280 0012 e807 4000 e007 600c 8090 0010 2280 0005 e207 6010 7ffa f5dc d007 600c e207 6010 8090 0011 0280 0004 0100 0000
3326620 7ffa f5d6 d007 6010 7ffa f5d4 d007 6014 1080 006d ba10 3fff b810 2000 253f fff7 a414 a02c 80a7 0014 b610 2000 1680 000c
3326700 b007 8012 7fff fefb 9010 0018 ea07 600c b807 2001 d025 401b e807 4000 b006 2004 80a7 0014 06bf fff8 b606 e004 ec07 4000
3326760 b810 2000 80a7 0016 3680 000c d007 6004 ee07 6010 f24e 0000 b006 2001 f22d c01c ec07 4000 b807 2001 80a7 0016 26bf fffa
3327040 ee07 6010 d007 6004 b810 2000 80a7 0008 1680 0015 b410 2000 f607 6014 7fff fedd 9010 0018 b606 c01a d026 c000 b006 2004
3327120 d84e 0000 b006 2001 980b 20ff d826 e004 e24e 0000 b807 2001 a20c 60ff e226 e008 d007 6004 b406 a00c 80a7 0008 06bf ffef
3327200 b006 2001 ea07 6008 b010 2000 80a7 0015 3680 000c f207 6018 ec07 6018 ee4e 0000 b006 2001 ee2d 801c ea07 6008 b807 2001
3327260 80a7 0015 26bf fffa ec07 6018 f207 6018 b010 2000 c02e 401c d007 4000 80a6 0008 3680 000f de07 6004 d207 6010 d20a 4018
3327340 d807 6004 80a2 400c 2a80 0004 d007 4000 1080 0019 ba10 3fff b006 2001 80a6 0008 26bf fff7 d207 6010 de07 6004 b010 2000
3327420 80a6 000f 1680 000f b810 2000 e007 6014 a004 001c e004 2008 e607 6008 80a4 0013 2680 0004 de07 6004 1080 0007 ba10 3fff
3327500 b006 2001 80a6 000f 06bf fff5 b807 200c ba10 2000 81c7 e008 91e8 001d 9de3 bfa0 1100 0569 fa02 2058 8090 001d 3280 000b
3327560 9410 2001 9210 201c 7ffa f6a0 9010 2001 ba10 0008 8090 001d 0280 002c 1300 0569 fa22 6058 9410 2001 c027 4000 d427 6004
3327640 9610 2004 d627 6008 d807 600c 8090 000c 2280 0006 da07 6010 7ffa f54c d007 600c c027 600c da07 6010 8090 000d 2280 0006
3327720 de07 6014 7ffa f545 d007 6010 c027 6010 de07 6014 8090 000f 2280 0005 9210 200c 7ffa f53e d007 6014 9210 200c 7ffa f67f
3330000 9010 2001 d027 6014 e007 6014 9010 2004 c024 0000 e207 6014 7ffa f45d c024 6008 d027 6018 d007 6018 1300 0569 4000 0165
3330060 9212 604c ba10 2000 81c7 e008 91e8 001d 9de3 bfa0 9010 2001 1300 0569 d022 605c 1100 0569 4000 0223 9012 2050 ba10 0008
3330140 8090 001d 0280 0006 0100 0000 d44f 4000 8090 000a 0230 0007 0100 0000 7fff fe58 9010 001d 8090 0008 0280 0004 0100 0000
3330220 7fff ffb3 0100 0000 81c7 e008 81e8 0000 9de3 bfa0 9010 2001 1300 0569 d022 605c 7fff fe4b 9010 2000 8090 0008 0280 0004
3330300 0100 0000 7fff ffa6 0100 0000 81c7 e008 81e8 0000 9de3 bf98 1100 0569 d002 205c 8090 0008 3280 0005 1300 0569 7fff ffd5
3330360 0100 0000 1300 0569 f802 6058 8090 001c 3280 0004 f006 0000 1080 003d b810 2000 f027 bffc d607 0000 8090 000b 2280 0009
3330440 ba10 2000 d807 200c de07 bffc d803 0000 80a3 c00c 3680 0011 e807 0000 ba10 2000 b010 2000 e007 2014 a004 001d e004 2004
3330520 8090 0010 2280 001c fa07 2014 e607 2004 b006 2001 80a6 0013 06bf fff7 ba07 600c 1080 0014 b010 2000 b010 2001 80a6 0014
3330600 1680 000d ba10 2004 ea07 200c ee07 bffc ea05 401d 80a5 c015 2680 0008 b226 2001 e807 0000 b006 2001 80a6 0014 06bf fff7
3330660 ba07 6004 b226 2001 f007 2010 f00e 0019 fa07 2014 b12e 2002 952e 2001 b006 000a ba07 4018 d207 4000 4000 0015 9007 bffc
3330740 da07 6004 da22 2020 f807 2018 fa07 6008 b807 001d f822 2024 b810 0008 81c7 e008 91e8 001c 9de3 bfa0 9010 0018 4000 0008
3331020 9210 2000 b010 0008 1100 0569 9012 2053 d026 2024 81c7 e008 81e8 0000 9de3 bfa0 1100 0569 2100 0054 f227 a048 b602 2060
3331100 d006 0000 7ffe 6151 9204 2180 b810 0008 d006 0000 7fff c27b 9204 2180 ae10 0019 b002 0017 8090 0018 1680 0005 ba04 2180
3331160 b086 001d 0cbf ffff b827 2001 1700 0054 ba02 e180 80a6 001d 2680 0007 9210 2e10 b026 001d 80a6 001d 16bf fffe b807 2001
3331240 9210 2e10 7ffe 6139 9010 0018 d026 e008 9010 0018 7fff c263 9210 2e10 b010 0008 9010 0018 7ffe 6131 9210 203c d026 e004
3331320 9010 0018 7fff c25b 9210 203c d026 c000 9007 2004 7fff c257 9210 2007 d026 e018 d806 e018 8090 000c 3680 0006 8090 001c
3331400 da06 e018 9a03 6007 da26 e018 8090 001c 0680 0028 b010 27b2 2100 0569 b204 2020 a210 0018 8090 0011 1680 0006 a410 2003
3331460 a220 0011 a20c 8011 1080 0003 a220 0011 a20c 4012 8090 0011 3280 0009 9210 2190 9210 2064 7fff c23b 9010 0018 8090 0008
3331540 1280 0008 0100 0000 9210 2190 7fff c235 9010 0018 8090 0008 3280 0003 ba10 2000 ba10 2001 b410 001d bb2f 6002 ba07 4019
3331620 ea07 4000 80a7 0015 2680 0029 b026 276c fa07 4000 b006 2001 10bf ffde b827 001d 1100 0569 b202 2020 b026 2001 9210 0018
3331700 8090 0009 1680 0006 9410 2003 9220 0009 920a 8009 1080 0003 9220 0009 920a 400a 8090 0009 3280 0009 9210 2190 9210 2064
```

1901

```
3331760 7fff c214 9010 0018 8090 0008 1280 0008 0100 0000 9210 2190 7fff c20e 9010 0018 8090 0008 3280 0003 ba10 2000 ba10 2001
3332040 b410 001d bb2f 6002 fa07 4019 b887 c01d 2cbf ffe3 b026 2001 b026 276c f026 e014 f826 e01c b12e a004 a12e 2001 c026 e010
3332120 e606 e010 2300 c568 a214 63c0 b006 0010 b006 0011 a72c e002 e606 0013 80a7 0013 2680 0010 b807 2001 ec06 e010 ad2d a002
3332200 ec06 0016 d406 e010 b827 0016 9402 a001 1426 e010 e606 e010 a72c e002 e606 0013 80a7 0013 36bf fff6 ec06 e010 b807 2001
3332260 f826 e00c 1b00 0569 9a13 6057 c026 e020 1a26 e024 ee26 e029 81c7 e008 91e8 001b 9810 0008 da4a 0000 8090 000d 12bf fffe
3332340 9002 2001 9022 2001 da4a 4000 da2a 0000 9090 000d 9202 6001 12bf fffc 9002 2001 81c3 e008 9000 000c 9de3 bf98 9007 bff8
3332420 4000 0018 9210 2000 8090 0008 3680 0004 8090 0018 1080 0007 b010 3fff 2280 0005 f007 bff8 d007 bff8 d026 0000 f007 bff8
3332500 81c7 e008 91e8 0000 8210 2021 91d0 2000 1a80 0004 1b00 0345 9a13 61c0 81c3 4000 0100 0000 81c3 e008 0100 0000 0000 0000
3332560 8210 2074 91d0 2000 1a80 0004 1b00 0345 9a13 61c0 81c3 4000 0100 0000 81c3 e008 0100 0000 0000 0000 8210 2003 91d0 2000
3332640 1a80 0004 1b00 0345 9a13 61c0 81c3 4000 0100 0000 81c3 e008 0100 0000 0000 0000 9de3 bfc0 b68e 6003 0280 001c b410 0018
3332720 80a6 e002 0280 000a 80a6 e003 f60e 4000 b206 6001 f62e 0000 0280 0011 8090 001b 1280 0003 b006 2001 3080 00ac f616 4000
3333000 b206 6002 b936 e008 8090 001c f82e 0000 3280 0003 f62e 2001 3080 00a4 b68e e0ff 1280 0006 b006 2002 3080 00a0 1280 0003
3333060 b006 2001 3080 009d 211f bfbf a014 22ff 2320 4040 a214 6100 253f c000 2700 3fc0 b68e 2003 0280 0080 a934 e008 80a6 e002
3333140 0280 0050 80a6 e003 f606 4000 b206 6004 0280 0037 808e c012 1280 0003 808e c013 3080 008c 1280 0003 808e c014 3080 002b
3333220 1280 0003 808e e0ff 3080 0026 0280 0024 9736 e018 d62e 0000 9736 e009 d636 2001 b006 2003 9610 001b 9010 2018 1080 0003
3333300 9210 2008 b006 2004 952a c008 d606 4000 b206 6004 b732 c009 b616 c00a aa06 c010 aa1d 401b aa0d 4011 80a5 4011 22bf fff6
3333360 f626 0000 808e c012 1280 0003 808e c013 3080 006c 1280 0003 808e c014 3080 000b 1280 0003 808e e0ff 3080 0006 f626 0000
3333440 12bf ffea b006 2004 3080 0060 f62e 2003 9736 e008 d62e 2002 9736 e018 d62e 0000 9736 e010 1080 0059 d62e 2001 1280 0003
3333520 808e c013 3080 0057 1280 0003 808e c014 30bf fff6 1280 0003 808e e0ff 30bf fff1 02bf ffef 9736 e018 d62e 0000 b006 2001
3333600 9610 001b 9010 2008 10bf ffd0 9210 2018 9736 e010 d636 0000 1080 0044 f636 2002 f606 4000 b206 6004 808e c012 1280 0003
3333660 808e c013 3080 003f 1280 0003 808e c014 3080 003f 1280 0003 808e e0ff 3080 0040 02bf fff0 9736 e010 d636 0000 b006 2002
3333740 1080 0003 9610 001b b006 2004 952a e010 d606 4000 b206 6004 b732 e010 b616 c00a aa06 c010 aa1d 401b aa0d 4011 80a5 4011
3334020 22bf fff6 f626 0000 808e c012 1280 0003 808e c013 3080 0023 1280 0003 808e c014 3080 0023 1280 0003 808e e0ff 3080 0024
3334100 f626 0000 12bf ffea b006 2004 3080 0017 b006 2004 f606 4000 b206 6004 aa06 c010 aa1d 401b aa0d 4011 80a5 4011 22bf fff9
3334160 f626 0000 808e c012 1280 0003 808e c013 3080 000c 1280 0003 808e c014 3080 000c 1280 0003 808e e0ff 3080 000d f626 0000
3334240 12bf ffed b006 2004 81c7 e008 91ee 8000 c02e 0000 81c7 e008 91ee 8000 b936 e010 f836 0000 81c7 e009 91ee 8000 b936 e010
3334320 f836 0000 c02e 2002 81c7 e008 91ee 8000 9de3 bfa0 1100 01d1 fa02 2030 8090 001d 2280 000d ba10 2000 d207 4000 8090 0009
3334400 2280 0009 ba10 2000 d207 4000 4000 0008 9010 0018 8090 0008 02bf fff8 ba07 6004 ba10 0008 81c7 e008 91e8 001d da4a 4000
3334460 d44a 0000 80a2 800d 1280 0008 9202 6001 164a 0000 80a2 e03d 12bf fff9 9002 2001 1080 000b 9010 0009 d04a 0000 8090 0008
3334540 3280 0007 9010 2000 d84a 7fff 80a3 203d 3280 0003 9010 2000 9010 0009 81c3 e008 0100 0000 0000 0000 0015 8800 0015 8d60
3334620 0015 89d8 0015 91f4 0000 0000 0000 0000 4029 2329 3839 2f30 382f 3233 2064 6174 652e 6320 2020 2020 3333 2e31 c000 0000
3334700 0015 a2c8 0015 a2cf 0015 a2d6 0015 a2de 0015 a2e8 0015 a2f1 0015 a2f8 0015 a301 0015 a309 0015 a312 0015 a318 0015 a31e
3334760 0015 a322 0015 a327 0015 a32c 0015 a333 0015 a33d 0015 a345 0015 a34e 0015 a357 0015 a365 0015 a373 0015 a381 0015 a38f
3335040 0015 a392 0000 0000 403e 99a0 2752 5461 4076 d400 0000 0000 5375 6e64 6179 004d 6f6e 6461 7900 5475 6573 6461 7900 5765
3335120 646e 6573 6461 7900 5468 7572 7364 6179 0046 7269 6461 7900 5361 7475 7264 6179 004a 616e 7561 7279 0046 6562 7275 6172
3335200 7900 4d61 7263 6800 4170 7269 6c00 4d61 7900 4a75 6e65 004a 756c 7900 4175 6775 7374 0053 6570 7465 6d62 6572 004f 6374
3335260 6f62 6572 004e 6f76 656d 6265 7200 4465 6365 6d62 6572 0061 6e74 6520 6d65 7269 6469 656d 0070 6f73 7420 6d65 7269 6469
3335340 656d 0041 6e74 6520 4d65 7269 6469 656d 0050 6f73 7420 4d65 7269 6469 656d 0061 6d00 706d 0074 6800 7374 006e 6400 7264
3335420 0025 3357 2025 334d 2025 3264 2025 3032 533a 2530 3269 3a25 3032 7320 2534 7900 0000 001f 0000 001c 0000 001f 0000 001e
3335500 0000 001f 0000 001e 0000 001f 0000 001f 0000 001e 0000 001f 0000 001e 0000 001f 0000 001f 0000 001d 0000 001f 0000 001e
3335560 0000 001f 0000 001e 0000 001f 0000 001f 0000 001e 0000 001f 0000 001e 0000 001f 0000 016d 0000 016e 6c6f 6361 6c74 696d
3335640 6500 2f75 7372 2f73 6861 7265 2f6c 6962 2f7a 6f6e 6569 6e66 6f00 2f00 474d 5400 545a 0047 4d54 0000 0000 0000 0000 0000
3335720 0000 0000 0000 0000 0000 0000 0000 0000 0000 0000 0000 0000 0000 0000 0000 0000 0000 0000 0000 0000 0000 0000 0000 0000
```

1902

```
*
3336520 0000 0000 0000 0000 0000 0000 0000 0000 0000 0000 0000 0000 0000 0000 0000 0000 0014 7f08 0015 86b8 000f 4de8 0000 0000
3336600 0014 7f98 0015 a608 000f 4e60 0000 0000 0014 7dc8 0015 a618 0012 0a88 0700 714f 0000 70af 0000 001c 0014 4d00 0014 4d00
3336660 0021 0000 0000 0000 0015 3524 0000 0010 0015 bcf8 0000 0008 0012 0afc 0300 716f 0000 70af 0000 000c 0015 a680 0015 a680
3336740 0001 0076 0000 0000 0015 b52c 0015 bc8c 2cac a4de 0002 438a 2ca0 1d9d 0000 0000 0000 0001 0014 4e24 0014 5004 0002 438a
3337020 0015 a5a4 0014 7d04 0012 0b30 0e00 7177 0000 70af 0000 0038 0014 516c 0014 516c 0001 0076 0000 0000 0008 e8cc 0e00 717f
3337100 0000 70af 0000 0038 0014 525c 0014 525c 0001 0076 0000 0000 0012 0cb8 0e00 7187 0000 70af 0000 0038 0014 534c 0014 534c
3337160 0001 0076 0000 0000 0000 75f7 b328 a6f2 0015 681c 0000 0000 000e 7f24 0000 0000 0004 202d 6420 0000 000c 203e 202f 6465
3337240 762f 6e75 6c6c 0000 0005 5245 4733 3290 0005 6261 7463 6800 000d 6573 7469 6d61 7465 5f73 697a 6500 0010 6368 6970 7369
3337320 7a65 7220 2d67 2024 6420 00e4 000f 6372 6561 7465 5f64 646c 5f66 696c 6500 a758 0018 7d04 0015 a718 0014 53fc 0200 70af
3337400 0000 3287 0000 0008 0014 8a28 0014 8a28 0041 0000 0000 0000 0015 a788 0300 70af 0000 3287 0000 000c 0015 a7c8 0015 a7c8
3337460 0041 0000 0000 0000 2c78 0010 0002 438a 239c 0000 0015 60d4 0015 60e4 0100 70d7 0000 3287 0000 0004 0015 a7f8 0015 a7f8
```

1903

1904

```
3337540  0041 0000 0000 0000 2c78 0010 0002 438a 239c 0000 0015 60f4 0015 6144 0100 70df 0000 3287 0000 0004 0015 a828 0015 a828
3337620  0041 0000 0000 0000 2c78 0010 0002 438a 239c 0000 0015 6114 0015 a808 0200 70df 0000 3287 0000 0008 0015 a858 0015 a858
3337700  0041 0000 0000 0000 2c78 0010 0002 438a 239c 0000 0015 6134 0015 a838 0300 70df 0000 3287 0000 000c 0015 a888 0015 a888
3337760  0041 0000 0000 0000 2c78 0010 0002 438a 239c 0000 0015 6154 0015 61e4 0100 70e7 0000 3287 0000 0004 0015 a8b8 0015 a8b8
3340040  0041 0000 0000 0000 2c78 0010 0002 438a 239c 0000 0015 6174 0015 a898 0200 70e7 0000 3287 0000 0008 0015 a8e8 0015 a8e8
3340120  0041 0000 0000 0000 2c78 0010 0002 438a 239c 0000 0015 6194 0015 a8c8 0300 70e7 0000 3287 0000 000c 0015 a918 0015 a918
3340200  0041 0000 0000 0000 2c78 0010 0002 438a 239c 0000 0015 61b4 0015 a8f8 0600 70e7 0000 3287 0000 0018 0015 a948 0015 a948
3340260  0041 0000 0000 0000 2c78 0010 0002 438a 239c 0000 0015 61d4 0015 a928 0700 70e7 0000 3287 0000 001c 0015 a978 0015 a978
3340340  0041 0000 0000 0000 2c78 0010 0002 438a 239c 0000 0015 61f4 0015 6224 0200 70ef 0000 3287 0000 0008 0015 a9a8 0015 a9a8
3340420  0041 0000 0000 0000 2c78 0010 0002 438a 239c 0000 0015 6214 0015 a988 0300 70ef 0000 3287 0000 000c 0015 a9d8 0015 a9d8
3340500  0041 0000 0000 0000 2c78 0010 0002 438a 239c 0000 0015 6234 0015 6264 0200 70f7 0000 3287 0000 0008 0015 aa08 0015 aa08
3340560  0041 0000 0000 0000 2c78 0010 0002 438a 239c 0000 0015 6254 0015 a9e8 0300 70f7 0000 3287 0000 000c 0015 aa38 0015 aa38
3340640  0041 0000 0000 0000 2c78 0010 0002 438a 239c 0000 0015 6274 0015 8498 0100 70ff 0000 3287 0000 0004 0015 aa68 0015 aa68
3340720  0041 0000 0000 0000 2c78 0010 0002 438a 239c 0000 0015 6294 0017 7772 6974 655f 6465 7369 676e 735f 696e 746f 5f66 696c
3341000  6500 0db5 001d 2020 2020 2045 7865 6375 7469 6e67 2043 6869 7053 697a 6572 2854 4d29 2e00 0014 6368 6970 7369 7a65 7220
3341060  2d62 7269 6566 202d 6420 00f7 0025 2020 2020 2043 6869 7053 697a 6572 2074 6572 6d69 6e61 7465 6420 6162 6e6f 726d 616c
3341140  6c79 2e00 0015 7265 6164 5f63 6869 7073 697a 6572 5f72 6570 6f72 7400 0012 0bdc 0200 7197 0000 3287 0000 0008 0015 4138
3341220  0015 4138 0001 0074 0000 0000 0012 0c30 0200 71a7 0000 3287 0000 0008 0015 4388 0015 4388 0001 0074 0000 0000 0010 acac
3341300  0100 71d7 0000 3287 0000 0004 0016 6eb8 0016 6eb8 0001 007e 0000 0000 001b 6573 7469 6d61 7465 5f73 697a 655f 7759 7468
3341360  5f67 7261 7068 6363 7300 2139 0025 2020 2020 2043 7265 6174 696e 6720 4444 4c20 6669 6c65 2066 6f72 2043 6869 7073 697a
3341440  6572 2e00 001d 2020 2020 2045 7865 6375 7469 6e67 2043 6869 7053 697a 6572 2874 6d29 2e00 0012 0e70 0200 71ef 0000 3287
3341520  0000 0008 0015 4284 0015 4284 0001 0074 0000 0000 0025 2020 2020 2043 7265 6174 696e 6720 4444 4c20 6669 6c65 2066 6f72
3341600  2043 6869 7053 697a 6572 2e00 000e 636c 6f73 655f 6464 6c5f 6669 6c65 0015 ac12 000f 7265 6d6f 7665 5f64 646c 5f66 696c
3341660  6500 0ddf 0012 0fd4 0000 720f 0000 3287 0000 0000 0015 4d20 0015 4d20 0001 0074 0000 0000 0012 1080 0100 721f 0000 3287
3341740  0000 0004 0015 4dd4 0015 4dd4 0001 0074 0000 0000 0012 10c0 0100 7227 0000 3287 0000 0004 0015 aee0 0015 aee0 0001 0074
3342020  0000 0000 0012 1100 0000 722f 0000 3287 0000 0000 0015 b508 0015 b508 0001 0074 0000 0000 0012 74a4 0100 7237 0000 3287
3342100  0000 0004 0015 b53c 0015 b53c 0001 0074 0000 0000 001e 2020 2020 2046 696e 6469 6e67 2066 6561 7369 626c 6520 6465 7369
3342160  676e 732e 0015 ab62 0010 6665 6173 6962 6c65 5f64 6573 6967 6e73 0026 0008 ea2c 0200 7247 0000 3287 0000 0008 0015 ad70
3342240  0015 ad70 0001 0074 0000 0000 0012 1378 0300 728f 0000 3287 0000 000c 0015 4668 0015 4668 0001 0074 0000 0000 27f0 0014
3342320  0015 ada8 4e1c 0000 0000 0007 54a8 2edc 2cac 0007 0002 438a 2ca0 0007 0000 0000 0000 0001 0015 ad5c 0015 ae10 0015 3e6c
3342400  0015 86e0 000f 6665 6173 6962 6c65 5f64 6573 6967 6e00 0ddf 28c4 0028 0015 ae10 56f8 671c 682c 5758 6b74 6a00 24d0 0000
3342460  0015 ade0 0014 2ecc 2410 0000 0015 ad2c 0012 11a8 0100 724f 0000 3287 0000 0004 0015 ae4c 0015 ae4c 0001 0074 0000 0000
3342540  001d 2020 2020 2049 676e 6f72 696e 6720 6465 7369 676e 3a20 7e77 2e7e 6e7e 6e00 2954 0028 0002 438a 56f8 671c 682c 46ec
3342620  4550 6b74 5370 42ac 0000 7257 0008 c0fc 0014 2330 0015 ad2c 27f0 0012 0015 ae88 4e1c 0000 0000 0007 228c 0453 2cac 7d44
3342700  0002 438a 2ca0 6cc5 0000 0000 0000 0001 0015 ae38 0015 ae88 0015 ae92 0015 ae70 0015 ae44 0010 636c 7573 7465 725f 6675
3342760  6e63 7469 6f6e 0071 2954 0024 0002 438a 56f8 671c 682c 3228 320c 247c 0015 aebc 0010 2ecc 2420 0000 0015 ade0 0012 11e8
3343040  0300 725f 0000 3287 0000 000c 0015 499c 0015 499c 0001 0074 0000 0000 27f0 0012 0015 af08 4e1c 0000 0000 0007 228c 6c54
3343120  2cac 0df7 0002 438a 2ca0 aed1 0000 0000 0000 0001 0015 aecc 0015 af08 0015 af12 0015 af04 0015 aed8 2954 0020 0002 438a
3343200  56f8 671c 682c 247c 0015 af38 0010 2ecc 2420 0000 0015 ac94 0012 1208 0100 7267 0000 3287 0000 0004 0015 4548 0015 4548
3343260  0001 0074 0000 0000 000f 6465 7369 676e 5f70 726f 6c6f 6775 6500 0007 000e 7772 6974 655f 636c 7573 7465 7273 0000 0ddf
3343340  0012 7772 6974 655f 6576 616c 5f73 6574 7469 6e67 0015 af92 0012 1240 0100 726f 0000 3287 0000 0004 0015 4b6c 0015 4b6c
3343420  0001 0074 0000 0000 0012 1274 0300 7277 0000 3287 0000 000c 0015 b01c 0015 b01c 0001 0074 0000 0000 0012 12d4 0000 727f
3343500  0000 3287 0000 0000 0015 529c 0015 529c 0001 0074 0000 0000 000e 209c 0000 7287 0000 3287 0000 0000 0015 4c88 0015 4c88
3343560  0001 0074 0000 0000 27f0 0012 0015 4604 4e1c 0000 0000 0007 228c b002 2cac 0ddf 0002 438a 2ca0 b00a 0000 0000 0000 0001
3343640  0015 b008 0015 4604 0015 460e 0015 b040 0015 b014 000d 7772 6974 655f 636c 7573 7465 7200 0019 6368 6970 7369 7a65 725f
3343720  6464 6c5f 6669 6c65 5f73 7472 6561 6d00 000f 7772 6974 655f 6265 6769 6e5f 6675 6e00 b06d 0016 7772 6974 655f 636c 7573
3344000  7465 725f 6675 6e63 7469 6f6e 0015 b082 0019 7772 6974 655f 6573 7469 6d61 7465 645f 7265 6769 7374 6572 7300 0015 7772
3344060  6974 655f 6573 7469 6d61 7465 645f 6d75 7865 7300 000d 7772 6974 655f 656e 645f 6675 6e00 000a 7772 6974 655f 696e 7374
3344140  0015 b0dd 0000 759f b328 6b74 0015 6460 0000 0000 0010 df64 0200 729f 0000 3287 0000 0008 0015 4fec 0015 4fec 0001 0074
3344220  0000 0000 ffff ffff 0200 72a7 0000 3287 0000 0008 0015 4704 0015 4704 0001 0074 0000 0000 000a a974 0200 72af 0000 3287
3344300  0000 0008 0015 47a8 0015 47a8 0001 0074 0000 0000 0012 7434 0200 72b7 0000 3287 0000 0008 0015 b254 0015 b254 0001 0074
3344360  0000 0000 0008 eb2c 0100 72bf 0000 3287 0000 0004 0015 b6bc 0015 b6bc 0001 0074 0000 0000 0012 7510 0300 72c7 0000 3287
3344440  0000 000c 0015 5224 0015 5224 0001 0074 0000 0000 000d 7772 6974 655f 6d65 6761 6675 6e00 000b 726f 756e 645f 666c 6f61
3344520  7400 0000 ffff ffff 0400 72cf 0000 3287 0000 0010 0015 5168 0015 5168 0001 0074 0000 0000 000b 636f 735f 6465 6772 6565
3344600  7300 0000 0015 86c0 0300 72d7 0000 3287 0000 000c 000a 18f0 0014 181c 0003 0077 0000 0000 000b 7772 6974 655f 6d75 7865
```

```
3344660  7300 b246 000a 4d55 5831 365f 3138 5f53 0000 0000 2c78 0014 0002 438a 3640 35c8 3588 22bc 0015 b278 0012 423c 0200 72e7
3344740  0000 3287 0000 0008 0014 86e0 0015 48d0 0001 0074 0000 0000 000a 4d55 5831 365f 3137 5f53 0000 0000 0008 c0cc 0400 72ef
3345020  0000 3287 0000 0010 000a 18f0 0014 1974 0003 0077 0300 0000 0025 2a2a 2a20 2043 616e 6e6f 7420 6669 6e64 2066 756e 6374
3345100  696f 6e61 6c20 756e 6974 2066 6f72 2000 0010 2069 6e20 7468 6520 6c69 6272 6172 792e 00df 000a 4d55 5831 365f 3136 5f53
3345160  0000 0000 ffff ffff 0300 72ff 0000 3287 0000 000c 000a 18f0 0014 1548 0003 0077 0000 0000 000a 4d55 5831 365f 3135 5f53
3345240  0000 0000 2c78 0020 0002 438a 2520 46ec 3310 247c 000b 4af4 0014 37f0 3cf4 234c 0014 0c78 000a 4d55 5831 365f 3134 5f53
3345320  0000 0000 2c78 0020 0002 438a 2520 46ec 3310 247c 0013 a364 0014 37f0 3cf4 234c 0011 4914 000a 4d55 5831 365f 3133 5f53
3345400  0000 0000 27f0 0014 0015 4afc 4e1c 0000 0000 0007 54a8 228c 2cac b391 0002 438a 2ca0 b39d 0000 0000 0000 0001 0015 b394
3345460  0015 4afc 0015 4b06 0015 b3cc 0015 b3a0 c01e 636c 6561 725f 6675 6e63 7469 6f6e 5f73 796d 626f 6c5f 636f 756e 7465 7273
3345540  0000 0007 0012 7772 6974 655f 6464 6c5f 7072 6f6c 6f67 7565 0000 0ddf 0003 4d55 5831 365f 3132 5f53 0000 0000 0008 ebac
3345620  0000 7317 0000 3287 0000 0000 0015 b4c0 0015 b4c0 0001 0074 0000 0000 0012 3644 0100 7327 0000 3287 0000 0004 0015 b574
3345700  0015 b574 0001 0074 0000 0000 0010 7772 6974 655f 6464 6c5f 6570 696c 6f67 00df 000a 4d55 5831 365f 3131 5f53 0000 0000
3345760  0012 36c4 0000 732f 0000 3287 0000 0000 0015 b7f4 0015 b7f4 0001 0074 0000 0000 000a 4d55 5831 365f 3130 5f53 0000 0000
3346040  0000 0083 b464 238d 0014 1944 0015 3eb4 2c78 0028 0002 438a 44a0 0000 0200 6f87 5f8c 43c0 0200 0daf 4b8c 0000 0000 6e3f
3346120  6bb4 22bc 0008 db9c 000a 636f 6e76 6572 7369 6f6e 0000 0000 0000 0103 b328 0007 0014 18dc 0000 0000 2c78 0024 0002 438a
3346200  2520 3310 4300 0000 0000 7297 0011 ffe4 0010 3cf4 242c 0000 0008 b95c 0000 0083 b328 b51d 0014 18ac 0000 0000 2c78 0028
3346260  0002 438a 4568 4af8 0000 733f 5370 4550 6b48 6bf4 4538 4af8 0000 7337 6bb4 22bc 0015 3d5c 0000 7587 b328 b6fc 0015 6360
3346340  0000 0000 2c78 0028 0002 438a 45c4 3310 4300 0000 0000 7297 0012 11f8 0014 2ecc 37f0 3cf4 242c 0000 0015 b5ac 0015 b43c
3346420  0200 7327 0000 3287 0000 0008 0015 4f2c 0015 4f2c 0001 0074 0000 0000 000d 2533 5720 2564 2025 334d 2025 7900 001f 2864
3346500  6573 6967 6e20 5e6e 616d 6520 7e77 205e 6461 7465 2022 7e77 227e 6e7e 6e00 b5d2 0015 b104 0100 729f 0000 3287 0000 0004
3346560  0015 b620 0015 b620 0001 0074 0000 0000 0000 0043 b328 b5fa 0014 187c 0000 0000 2c78 0024 0002 438a 45c4 3310 4300 0000
3346640  0000 7297 0012 11f8 0014 37f0 3cf4 234c 0015 b114 0003 4655 4e00 b635 000f 2866 756e 205e 6e61 6d65 207e 617e 6e00 0ddf
3346720  0015 b184 0000 72bf 0000 3287 0000 0000 0015 b690 0015 b690 0001 0074 0000 0000 0000 0023 b328 0007 0014 184c 0000 0000
3347000  2c78 0024 0002 438a 2520 3310 4300 0000 0000 7297 0012 11f8 0010 3cf4 242c 0000 0015 b194 0002 2029 0015 b6c6 2c78 0020
3347060  0002 438a 45bd 41e8 0000 7367 3b4c 0000 0008 ec3c 0010 2340 0008 d15c 0015 b1e4 0300 72cf 0000 3287 0000 000c 0015 50d0
3347140  0015 50d0 0001 0074 0000 0000 0000 000b b328 0007 0014 17f0 0000 0000 0004 4d46 554e 0007 0015 b1a4 0200 72c7 0000 3287
3347220  0000 0008 0015 b744 0015 b744 0001 0074 0000 0000 0000 7587 b328 0007 0015 638c 0000 0000 2c78 0028 0002 438a 45c4 4700
3347300  3310 42ac 0000 7297 0012 11f8 0018 386c 37f0 3cf4 242c 0000 0015 b1b4 0004 494e 5354 0056 0025 2869 6e73 7420 5e6e 616d
3347360  6520 7e77 205e 6675 6e63 207e 7720 5e74 696d 6573 2031 297e 6e7e 6e00 000a 636f 6d70 6172 6174 6f72 0000 0000 0015 afc8
3347440  0300 727f 0000 3287 0000 000c 0015 5334 0015 5334 0001 0074 0000 0000 0003 5345 5400 0007 000a 6172 6974 685f 756e 6974
3347520  0000 0000 0015 4965 0000 0000 0015 b4f8 0015 a678 2c78 0024 0002 438a 2520 3310 4300 0000 0000 7297 0012 11f8 0010 3cf4
3347600  242c 0000 0015 b828 0015 b480 0100 732f 0000 3287 0000 0004 0015 b838 0015 b838 0001 0074 0000 0000 2c78 0018 0002 438a
3347660  437c 41e8 0000 73a7 239c 0000 0008 c11c 000f 6372 6561 7465 5f66 646c 5f66 696c 6500 2285 0019 6368 6970 7369 7a65 725f
3347740  6664 6c5f 6669 6c65 5f73 7472 6561 6d00 0012 3e94 0100 73af 0000 3287 0000 0004 0015 4a7c 0015 4a7c 0001 0074 0000 0000
3350020  000a 6d75 6c74 6970 6c69 6572 0000 0000 000e 636c 6f73 655f 6664 6c5f 6669 6c65 0000 0ddf 0012 4138 0000 73bf 0000 3287
3350100  0000 0000 0015 b8f4 0015 b8f4 0001 0074 0000 0000 0000 6d47 b328 0000 0014 1444 0000 0000 2c78 0024 0002 438a 2520 3310
3350160  4300 0000 0000 73b7 0011 ffe4 0010 3cf4 242c 0000 0008 b95c 000f 7265 6d6f 7665 5f66 646c 5f66 696c 6500 b911 0015 837c
3350240  0100 73c7 0000 3287 0000 0004 0015 b95c 0015 b95c 0001 0074 0000 0000 000a 7375 6274 7261 6374 6f72 0000 0000 2c78 0028
3350320  0002 438a 4568 4af8 0000 73cf 5370 4550 6b48 6bf4 4538 4af8 0000 7337 6bb4 22bc 0015 3d5c 0012 7772 6974 655f 6664 6c5f
3350400  7072 6f6c 6f67 7565 0013 6a85 0012 4344 0100 73d7 0000 3287 0000 0004 0015 b9cc 0015 b9cc 0001 0074 0000 0000 000b 7369
3350460  6e5f 6465 6772 6565 7300 0000 2c78 0024 0002 438a 45c4 3310 4300 0000 0000 73b7 0012 11f8 0014 37f0 3cf4 234c 0015 ba00
3350540  0015 b99c 0200 73d7 0000 3287 0000 0008 0015 5628 0015 5628 0001 0074 0000 0000 000e 7772 6974 655f 6675 6e63 7469 6f6e
3350620  0013 6a14 0012 44d4 0400 73e7 0000 3287 0000 0010 0015 5694 0015 5694 0001 0074 0000 0000 0000 6d47 b328 69cc 0014 1418
3350700  0000 0000 0015 ba24 0500 73e7 0000 3287 0000 0014 0015 5704 0015 5704 0001 0074 0000 0000 0014 2866 756e 6374 696f 6e09
3350760  5e6e 616d 6520 7e77 7e6e 007e 0014 0928 7665 7273 696f 6e09 5e6e 616d 6520 7e77 7e6e 002e 0013 0909 095e 7465 6368 6e6f
3351040  6c6f 6779 207e 777e 6e00 0007 0013 0909 095e 7369 7a65 207e 7720 6761 7465 737e 6e00 0007 000d 0909 095e 7069 6e73 207e
3351120  777e 6e00 000e 6361 6c6c 5f63 6969 7073 697a 6572 0015 badd 0012 485c 0200 741f 0000 3287 0000 0008 0015 bb28 0015 bb28
3351200  0001 0074 0000 0000 000c 6368 6970 7369 7a65 722e 706c 0000 2cac 0007 0002 438a 2ca0 0007 0000 0004 0000 0002 0015 5810
3351260  0015 58a8 0002 438a 0015 b7e4 0015 b4b0 000b 696e 7465 7261 6374 6976 6500 bb46 000f 6368 6970 7369 7a65 725f 6720 2d64
3351340  2000 0007 0020 6368 6970 7369 7a65 7220 2d62 7269 6566 202d 7061 7468 2060 7077 6460 202d 6620 007d 0015 baf8 0300 741f
3351420  0000 3287 0000 000c 0015 bbb8 0015 bbb8 0001 0074 0000 0000 2cac bb9e 0002 438a 2ca0 0007 0000 0004 0000 0002 0015 5978
3351500  0015 5a2c 0002 438a 0015 bbfc 001b 6368 6970 7369 7a65 725f 6720 2d70 6174 6820 6070 7764 6020 2d66 2000 0483 0015 bc0d
3351560  0000 0000 0015 5984 0000 0000 0015 5a38 0015 bc04 b464 857c 0014 1628 0015 3530 b464 bc18 0014 15e8 0015 bc14 b464 88a0
3351640  0014 1578 0014 889c 0006 4353 535f 3136 0015 bc44 0006 4353 415f 3136 0015 bc50 0009 6573 7469 6d61 7465 7300 0005 4155
3351720  5f31 3600 0003 4644 3100 0000 0003 5234 3100 bc64 0018 f4c8 0000 0000 0003 7265 6400 43bc 0005 6164 6465 7200 0015 b610
```

```
3352000  0000 0000 0010 aa80 0000 0000 0014 836c 0015 bc94 0000 0000 0015 b7ed 0015 b6fc 0000 0000 0000 0000 0015 b680 0000 0000
3352060  0000 0000 0000 0000 000f 5f73 7472 7563 7475 7265 2e76 6864 6c00 683c 000f 6469 7370 6c61 795f 6465 7369 676e 7300 bcc8
3352140  0000 0000 0015 be6c 0000 002c b288 b66c 0000 cffd 7fff ffff 0016 4c20 0200 0db5 0100 15ad 0100 33fd 0000 000b 0000 315f
3352220  0036 2f68 6f6d 652f 6f73 6173 312f 612f 7669 6a61 792f 5648 444c 2f70 6172 7365 722f 7072 6f6c 6f67 2f6e 6577 6e65 772f
3352300  7633 2e31 2f64 7370 0074 696d 0039 2f68 6f61 652f 6f73 6173 312f 612f 7669 6a61 792f 5648 444c 2f70 6172 7365 722f 7072
3352360  6f6c 6f67 2f6e 6577 6e65 772f 7633 2e31 2f64 7370 2e70 6c00 002d 2020 2020 2045 7865 6375 7469 6e67 2044 5350 2028 666f
3352440  7220 6461 7461 2970 6174 6820 7379 6e74 6865 7369 7329 2e00 0030 2020 2020 2044 6174 6120 7061 7468 2073 796e 7468 6573
3352520  6973 2063 6f6d 706c 6574 6564 2073 7563 6365 7373 6675 6c6c 792e 006e 0000 002c 0016 23f4 b27c b66c 0000 1000 7fff ffff
3352600  0015 6794 0200 0db5 0200 2f35 0000 77af 0000 03db 0000 315f 0000 002c 0016 4258 b27c b66c 0000 1006 7fff ffff 0015 6388
3352660  0200 0db5 0200 224d 0000 77af 0000 3287 0000 315f c011 6375 7272 656e 745f 6469 7265 6374 6f72 7900 0015 bfbc 0000 0090
3352740  b27c b66c 0000 1002 0000 1005 000a d16d 0200 0db5 0200 270d 0000 77af 0000 3287 0000 315f 0015 bed0 0000 0038 b130 b66c
3353020  0000 1003 0000 1007 0015 bed5 0200 0db5 3500 1cdd 0000 77b7 0000 000b 0000 3287 00b2 6343 0000 03db 0000 315f 0015 bfbc
3353100  0000 002c b4f0 b4e4 0000 1002 7fff ffff 0008 b0dd 0000 0000 0000 0000 0015 be9c 0002 438a 0016 4ba0 2c78 00c0 0002 438a
3353160  45c4 42ac 0000 77bf 0008 ec1c 0014 247c 0008 d13c 0014 31f0 362c 4c70 0000 77c7 3280 4c70 0000 77cf 2ba0 0014 0062 4550
3353240  4b8c 0000 0000 71bf 5370 4538 4b8c 0000 0000 77e7 6bb4 4550 6bc8 6b74 4538 4af8 0000 77df 6bb4 4550 6d50 6b74 4538 4af8
3353320  0000 77d7 6bb4 247c 0015 3d5c 0010 42ac 0000 77ef 0008 ec1c 0010 247c 0008 d13c 0010 247c 0008 d13c 0010 2c88 0024 2c58
3353400  4300 0000 0000 77f7 0008 ec1c 0010 247c 0008 d13c 0010 247c 0008 d13c 0010 c5a8 3cf4 234c 0016 4c88 0015 deb4 0000 1e00
3353460  6573 6967 6e28 5f2c 204d 6573 7361 6765 2920 3a2d 0a09 6e6f 6465 6d61 7028 4d65 7373 6167 652c 2044 6573 6967 6e2c 2044
3353540  6573 6967 6e4e 616d 6529 2c0a 0964 6973 706c 6179 5f64 6573 6967 6e5f 696e 666f 2844 6573 6967 6e2c 2044 6573 6967 6e4e
3353620  616d 6529 2e0a 0a64 6973 706c 6179 5f64 6573 6967 6e5f 696e 666f 2844 6573 6967 6e2c 2044 6573 6967 6e4e 616d 6529 203a
3353700  2d0a 0965 7374 696d 6174 6564 5f73 697a 6528 4465 7369 676e 2c20 5369 7a65 292c 0a09 6573 7469 6d61 7465 645f 7265 6769
3353760  7374 6572 7328 4465 7369 676e 2c20 5f2c 2052 6567 6973 7465 7273 292c 0a09 6573 7469 6d61 7465 645f 6d75 7865 7328 4465
3354040  7369 676e 2c20 5f2c 204d 7578 6573 292c 0a09 6675 735f 666f 725f 6465 7369 676e 2844 6573 6967 6e2c 204c 6973 746f 6646
3354120  5573 292c 0a09 6161 7962 655f 6e65 7728 5669 6577 2c20 7669 6577 2844 6573 6967 6e4e 616d 6529 292c 0a09 7365 6e64 2856
3354200  6965 772c 2073 697a 652c 2073 697a 6528 3430 302c 3230 3029 292c 0a09 7365 6e64 2856 6965 772c 206f 7065 6e29 2c0a 0973
3354260  656e 6428 5669 6577 2c20 636c 6561 7229 2c09 0a09 6469 7370 6c61 795f 7465 726d 2864 6573 6967 6e3a 4465 7369 676e 2c20
3354340  5669 6577 292c 0a09 6469 7370 6c61 795f 7465 726d 2866 756e 6374 696f 6e73 3a4c 6973 746f 6646 5573 2c20 5669 6577 292c
3354420  0a09 6469 7370 6c61 795f 7465 726d 2872 6567 6973 7465 7273 3a52 6567 6973 7465 7273 2c20 5669 6577 292c 0a09 6469 7370
3354500  6c61 795f 7465 726d 286d 7578 6573 3a4d 7578 6573 2c20 5669 6577 292c 0a09 6469 7370 6c61 795f 7465 726d 2873 697a 653a
3354560  5369 7a65 2c20 5669 6577 292e 0a0a 6455 7369 676e 5f70 6f70 7570 2850 6963 7475 7265 2c20 7669 6577 2920 3a2d 0a09 6765
3354640  745f 7265 6628 5069 6374 7572 652c 6375 7272 656e 742c 4669 6775 7265 292c 0a09 7365 745f 636f 6c6f 7228 4669 6775 7265
3354720  2c20 4072 6564 292c 0a09 6e6f 6465 6d61 7028 4669 6775 7265 2c20 4465 7369 676e 2c20 5f44 6573 6967 6e4e 616d 6529 2c0a
3355000  0946 696c 6520 3120 2744 4553 4947 4e27 2c0a 0977 7269 7465 2827 2020 2020 2053 7461 7274 696e 6720 4368 6970 5369 7a65
3355060  722e 2050 6c65 6173 6520 5761 6974 2e2e 2e27 292c 206e 6c2c 0a09 7772 6974 655f 6465 7369 676e 735f 696e 746f 5f66 696c
3355140  6528 5b44 6573 6967 6e5d 2c20 4669 6c65 292c 0a09 280a 0909 7379 7374 656d 285b 2763 6869 7073 697a 6572 5f67 202d 6420
3355220  272c 2046 696c 652c 2027 2031 3e20 2f64 6576 2f6e 756c 6c20 323e 2631 275d 2920 2d3e 0a09 0977 7269 7465 2827 2020 2020
3355300  2043 6869 7053 697a 6572 2063 6f6d 706c 6574 6564 2073 7563 6365 7373 6675 6c6c 792e 2729 2c20 6e6c 0a09 3b0a 0909 7772
3355360  6974 6528 2720 2020 2020 4368 6970 5369 7a65 7220 7465 726d 696e 6174 6564 2061 626e 6f72 6d61 6c6c 792e 2729 2c20 6e6c
3355440  0a09 292c 0a09 7365 745f 636f 6c6f 7228 4669 6775 7265 2c20 4067 6f6c 6429 2e0a 0a64 6573 6967 6e5f 706f 7075 7028 5069
3355520  6374 7572 652c 2027 7772 6974 6520 5254 4c27 2920 3a2d 0a09 6765 745f 7265 6628 5069 6374 7572 652c 6375 7272 656e 742c
3355600  4669 6775 7265 292c 0a09 7365 745f 636f 6c6f 7228 4669 6775 7265 2c20 4072 6564 292c 0a09 6e6f 6465 6d61 7028 4669 6775
3355660  7265 2c20 4465 7369 676e 2c20 4465 7369 676e 4e61 6d65 292c 0a09 636f 6e63 6174 5f61 746f 6d28 5b44 6573 6967 6e4e 616d
3355740  652c 275f 7274 6c2e 7668 646c 275d 2c20 4669 6c65 292c 0a09 6f70 656e 2846 696c 652c 2077 7269 7465 2c20 5374 7265 616d
3356020  292c 0a09 666f 726d 6174 2827 2020 2020 2057 7269 7469 6e67 2052 542d 6c65 7665 6c20 6172 6368 6974 6563 7475 7265 2074
3356100  6f20 6669 6c65 3a20 7e77 7e6e 272c 205b 4669 6c65 5d29 2c0a 0970 7269 6e74 5f76 6864 6c28 5374 7265 616d 2c20 4465 7369
3356160  676e 292c 0a09 666c 7573 685f 6f75 7470 7574 2853 7472 6561 6d29 2c20 636c 6f73 6528 5374 7265 616d 292c 0a09 7365 745f
3356240  636f 6c6f 7228 4669 6775 7265 2c20 4067 6f6c 6429 2e0a 0a64 6573 6967 6e5f 706f 7075 7028 5069 6374 7572 652c 2027 7379
3356320  6e74 6865 7369 7a65 2729 203a 2d0a 0967 6574 5f72 6566 2850 6963 7475 7265 2c63 7572 7265 6e74 2c46 6967 7572 6529 2c0a
3356400  0973 6574 5f63 6f6c 6f72 2846 6967 7572 652c 2040 7265 6429 2c0a 096e 6f64 656d 6170 2846 6967 7572 652c 2044 6573 6967
3356460  6e2c 2044 6573 6967 6e4e 616d 6529 2c0a 0963 6f6e 6361 745f 6174 6f6d 285b 4465 7369 676e 4e61 6d65 2c27 5f72 746c 2e76
3356540  6864 6c27 5d2c 2052 544c 4669 6c65 292c 0a09 6f70 656e 2852 544c 4669 6c65 2c20 7772 6974 652c 2053 7472 6561 6d29 2c0a
3356620  0966 6f72 6d61 7428 2720 2020 2020 5772 6974 696e 6720 5254 2d6c 6576 656c 2061 7263 6869 7465 6374 7572 6520 746f 2066
3356700  696c 653a 207e 777e 6e27 2c20 5b52 544c 4669 6c65 5d29 2c0a 0970 7269 6e74 5f76 6864 6c28 5374 7265 616d 2c20 4465 7369
3356760  676e 292c 0a09 666c 7573 685f 6f75 7470 7574 2853 7472 6561 6d29 2c20 636c 6f73 6528 5374 7265 616d 292c 0a09 7365 745f
3357040  636f 6c6f 7228 4669 6775 7265 2c20 4072 6564 292c 0a09 636f 6e63 6174 5f61 746f 6d28 5b44 6573 6967 6e4e 616d 652c 275f
```

| | | | | | | | | | | | | | | | | | | | | | | | | |
|---|---|---|---|---|---|---|---|---|---|---|---|---|---|---|---|---|---|---|---|---|---|---|---|---|
| 3357120 | 7374 | 7275 | 6374 | 7572 | 652e | 7668 | 646c | 275d | 2c20 | 4e65 | 7446 | 696c | 6529 | 2c0a | 0928 | 6361 | 6c6c | 5f73 | 796e | 6f70 | 7379 | 7328 | 5254 | 4c46 |
| 3357200 | 696c | 652c | 204e | 6574 | 4669 | 6c65 | 2920 | 2d3e | 0a09 | 2020 | 2020 | 666f | 726d | 6174 | 2827 | 2020 | 2020 | 2053 | 796e | 7468 | 6573 | 697a | 6564 | 2064 |
| 3357260 | 6573 | 6967 | 6e20 | 696e | 2066 | 696c | 653a | 207e | 777e | 6e27 | 2c20 | 5b4e | 6574 | 4669 | 6c65 | 5129 | 3b74 | 7275 | 6529 | 2c0a | 0973 | 6574 | 5f63 | 6f6c |
| 3357340 | 6f72 | 2846 | 6967 | 7572 | 652c | 2040 | 676f | 6c64 | 292e | 0a0a | 3a2d | 2064 | 796e | 616d | 6963 | 206e | 6f64 | 656d | 6170 | 2f33 | 2e0a | 0a25 | 2525 | 2525 |
| 3357420 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 3357500 | 2525 | 2525 | 2525 | 2525 | 2525 | 2525 | 2525 | 2525 | 2525 | 2525 | 2525 | 2525 | 0a0a | 6469 | 7370 | 6c61 | 795f | 6465 | 7369 | 676e | 7320 | 3a2d | 0a09 | 6465 |
| 3357560 | 7369 | 676e | 7328 | 4465 | 7369 | 676e | 7329 | 2c0a | 0964 | 6973 | 706c | 6179 | 5f64 | 6573 | 6967 | 6e73 | 2844 | 6573 | 6967 | 6e73 | 292e | 0a0a | 6469 | 7370 |
| 3357640 | 6c61 | 795f | 6465 | 7369 | 676e | 7328 | 4465 | 7369 | 676e | 7329 | 203a | 2d0a | 0977 | 7269 | 7465 | 2827 | 2020 | 2020 | 2049 | 6e69 | 7469 | 616c | 697a | 696e |
| 3357720 | 6720 | 6469 | 7370 | 6c61 | 7920 | 7769 | 6e64 | 6f77 | 2e27 | 292c | 6e6c | 2c0a | 0969 | 6e69 | 745f | 6573 | 7469 | 6d61 | 7465 | 735f | 7069 | 6374 | 7572 | 652c |
| 3360000 | 0a09 | 7265 | 7472 | 6163 | 7461 | 6c6c | 296e | 6f64 | 656d | 6170 | 295f | 2c5f | 2c5f | 2929 | 2c0a | 0977 | 7269 | 7465 | 2820 | 2020 | 2020 | 2027 | 4469 | 7370 |
| 3360060 | 6c61 | 7969 | 6e67 | 2064 | 6573 | 6967 | 6e73 | 2729 | 2c6e | 6c2c | 0a09 | 4d61 | 7857 | 6964 | 7468 | 203d | 2035 | 3030 | 2c0a | 2509 | 4d61 | 7848 | 6569 | 6768 |
| 3360140 | 7420 | 3d20 | 3430 | 392c | 0a09 | 5369 | 7a65 | 203d | 2031 | 3530 | 2c0a | 094d | 6178 | 4e75 | 6d20 | 6973 | 204d | 6178 | 5769 | 6474 | 682f | 2f53 | 697a | 652c |
| 3360220 | 0a09 | 6d61 | 785f | 6465 | 7369 | 676e | 5f73 | 697a | 6528 | 4465 | 7369 | 676e | 732c | 204d | 6178 | 5369 | 7a65 | 292c | 0a09 | 6469 | 7370 | 6c61 | 795f | 6465 |
| 3360300 | 7369 | 676e | 7328 | 4465 | 7369 | 676e | 732c | 2053 | 697a | 652c | 204d | 6178 | 5369 | 7a65 | 2c20 | 4d61 | 784e | 756d | 292e | 0a0a | 6469 | 7370 | 6c61 | 795f |
| 3360360 | 6465 | 7369 | 676e | 7328 | 5b44 | 6573 | 6967 | 6e7c | 4465 | 7369 | 676e | 735d | 2c20 | 4465 | 6c74 | 612c | 204d | 6178 | 5369 | 7a65 | 2c20 | 4d61 | 784e | 756d |
| 3360440 | 2920 | 3a2d | 0a09 | 5920 | 6973 | 2044 | 656c | 7461 | 2f2f | 322c | 0a09 | 5920 | 6973 | 2044 | 656c | 7461 | 2f2f | 322c | 0a09 | 6469 | 7370 | 6c61 | 795f | 6465 |
| 3360520 | 7369 | 676e | 7328 | 5b44 | 6573 | 6967 | 6e7c | 4465 | 7369 | 676e | 735d | 2c20 | 4465 | 6c74 | 612c | 204d | 6178 | 5369 | 7a65 | 2c20 | 4d61 | 784e | 756d | 2c20 |
| 3360600 | 302c | 2058 | 2c20 | 5929 | 2e0a | 0a64 | 6973 | 706c | 6179 | 5f64 | 6573 | 6967 | 6e73 | 285b | 5d2c | 205f | 2c20 | 5f2c | 205f | 2c20 | 5f2c | 205f | 2c20 | 5f29 |
| 3360660 | 203a | 2d20 | 212e | 0a64 | 6973 | 706c | 6179 | 5f64 | 6573 | 6967 | 6e73 | 285b | 4465 | 7369 | 676e | 7c44 | 6573 | 6967 | 6e73 | 5d2c | 2044 | 656c | 7461 | 2c20 |
| 3360740 | 4d61 | 7853 | 697a | 652c | 204d | 6178 | 4e75 | 6d2c | 204e | 2c20 | 582c | 2059 | 2920 | 3a2d | 0a09 | 4e20 | 3c20 | 4d61 | 784e | 756d | 2c0a | 0964 | 6973 | 706c |
| 3361020 | 6179 | 5f64 | 6573 | 6967 | 6e28 | 4465 | 7369 | 676e | 2c20 | 582c | 2059 | 2c20 | 4465 | 6c74 | 612c | 204d | 6178 | 5369 | 7a65 | 292c | 0a09 | 4e65 | 7758 | 2069 |
| 3361100 | 7320 | 5820 | 2b20 | 4465 | 6c74 | 612c | 0a09 | 4e31 | 2069 | 7320 | 4e20 | 2b20 | 312c | 0a09 | 212c | 0a09 | 6469 | 7370 | 6c61 | 795f | 6465 | 7369 | 676e | 7328 |
| 3361160 | 4465 | 7369 | 676e | 732c | 2044 | 656c | 7461 | 2c20 | 4d61 | 7853 | 697a | 652c | 204d | 6178 | 4e75 | 6d2c | 204e | 312c | 204e | 6577 | 582c | 2059 | 292e | 0a64 |
| 3361240 | 6973 | 706c | 6179 | 5f64 | 6573 | 6967 | 6e73 | 2844 | 6573 | 6967 | 6e73 | 2c20 | 4465 | 6c74 | 612c | 204d | 6178 | 5369 | 7a65 | 2c20 | 4d61 | 784e | 756d | 2c20 |
| 3361320 | 5f4e | 2c20 | 5f58 | 2c20 | 5929 | 203a | 2d0a | 094e | 6577 | 5920 | 6973 | 2044 | 656c | 7461 | 2f2f | 322c | 0a09 | 4e65 | 7759 | 2069 | 7320 | 5920 | 2b20 | 4465 |
| 3361400 | 6c74 | 612c | 0a09 | 6469 | 7370 | 6c61 | 795f | 6465 | 7369 | 676e | 7328 | 4465 | 7369 | 676e | 732c | 2044 | 656c | 7461 | 2c20 | 4d61 | 7853 | 697a | 652c | 204d |
| 3361460 | 6178 | 4e75 | 6d2c | 2030 | 2c20 | 4e65 | 7758 | 2c20 | 4e65 | 7759 | 292e | 0a09 | 0a64 | 6973 | 706c | 6179 | 5f64 | 6573 | 6967 | 6e28 | 4465 | 7369 | 676e | 2c20 |
| 3361540 | 582c | 2059 | 2c20 | 4465 | 6c74 | 612c | 204d | 6178 | 5369 | 7a65 | 2920 | 3a2d | 0a09 | 6573 | 7469 | 6d61 | 7465 | 645f | 7369 | 7a65 | 2844 | 6573 | 6967 | 6e2c |
| 3361620 | 205b | 572c | 205f | 482c | 205f | 556e | 6974 | 735d | 292c | 0a09 | 5465 | 6d70 | 2069 | 7320 | 572f | 4d61 | 7853 | 697a | 652a | 4465 | 6c74 | 612a | 302e | 3735 |
| 3361700 | 2c0a | 0972 | 6f75 | 6e64 | 5f66 | 6c6f | 6174 | 2854 | 656d | 702c | 2053 | 697a | 6529 | 2c0a | 0963 | 6765 | 6e73 | 796d | 2827 | 4465 | 7369 | 676e | 272c | 2044 |
| 3361760 | 6573 | 6967 | 6e4e | 616d | 6529 | 2c0a | 096d | 6179 | 6265 | 5f6e | 6577 | 2847 | 656e | 6572 | 6963 | 2c20 | 7072 | 6f74 | 6f28 | 6e69 | 6c2c | 2030 | 2929 | 2c0a |
| 3362040 | 096d | 616b | 655f | 706f | 7075 | 7028 | 506f | 7075 | 702c | 2027 | 272c | 2040 | 6573 | 7469 | 6d61 | 7465 | 5f70 | 6963 | 2c20 | 6465 | 7369 | 676e | 5f70 | 6f70 |
| 3362120 | 7570 | 2c0a | 0909 | 0909 | 095b | 7669 | 6577 | 2c27 | 7772 | 6974 | 6520 | 5254 | 4c27 | 2c73 | 796e | 7468 | 6573 | 697a | 655d | 292c | 0a09 | 7365 | 6e64 | 2847 |
| 3362200 | 656e | 6572 | 6963 | 2c20 | 706f | 7075 | 702c | 2050 | 6f70 | 7570 | 292c | 0a09 | 6d61 | 7962 | 655f | 6e65 | 7728 | 4465 | 7369 | 676e | 5f70 | 726f | 746f | 2c20 |
| 3362260 | 7072 | 6f74 | 6f28 | 4465 | 7369 | 676e | 4e61 | 6d65 | 2c20 | 4765 | 6e65 | 7269 | 6329 | 292c | 0a09 | 6e65 | 7728 | 426f | 782c | 2062 | 6f78 | 2830 | 2c30 | 2c20 |
| 3362340 | 5369 | 7a65 | 2c20 | 5369 | 7a65 | 2929 | 2c0a | 0973 | 656e | 6428 | 426f | 782c | 2063 | 6f6c | 6f72 | 2c20 | 4067 | 6f6c | 6429 | 2c0a | 0973 | 656e | 6428 | 426f |
| 3362420 | 782c | 2070 | 656e | 2c20 | 3529 | 2c0a | 0973 | 656e | 6428 | 4465 | 7369 | 676e | 5f70 | 726f | 746f | 2c20 | 6170 | 7065 | 6e64 | 2c20 | 426f | 7829 | 2c0a | 096e |
| 3362500 | 6577 | 2846 | 6967 | 7572 | 652c | 2066 | 6967 | 7572 | 6528 | 4465 | 7369 | 676e | 5f70 | 726f | 746f | 2c20 | 582c | 2059 | 2929 | 2c0a | 0954 | 6578 | 744c | 6f63 |
| 3362560 | 2069 | 7320 | 5369 | 7a65 | 202f | 2f32 | 2c0a | 0961 | 6464 | 5f74 | 6578 | 7428 | 4669 | 6775 | 7265 | 2c20 | 7465 | 7874 | 2844 | 6573 | 6967 | 6e4e | 616d | 652c |
| 3362640 | 2054 | 6578 | 744c | 6f63 | 2c20 | 5465 | 7874 | 4c6f | 632c | 2063 | 656e | 7465 | 7229 | 292c | 0a09 | 7365 | 6e64 | 2846 | 6967 | 7572 | 652c | 2064 | 6576 | 6963 |
| 3362720 | 652c | 2040 | 6573 | 7469 | 6d61 | 7465 | 5f70 | 6963 | 292c | 0a09 | 6173 | 7365 | 7274 | 286e | 6f64 | 656d | 6170 | 2846 | 6967 | 7572 | 652c | 2044 | 6573 | 6967 |
| 3363000 | 6e2c | 2044 | 6573 | 6967 | 6e4e | 6161 | 6529 | 292e | 0a0a | 6d61 | 785f | 6465 | 7369 | 676e | 5f73 | 697a | 6528 | 4465 | 7369 | 676e | 732c | 204d | 6178 | 5369 |
| 3363060 | 7a65 | 2920 | 3a2d | 0a09 | 6465 | 7369 | 676e | 5f73 | 697a | 6573 | 2844 | 6573 | 6967 | 6e73 | 2c20 | 5369 | 7a65 | 7329 | 2c0a | 0973 | 656c | 6563 | 745f | 6d61 |
| 3363140 | 7828 | 4d61 | 7853 | 697a | 652c | 2053 | 697a | 6573 | 2c20 | 5f29 | 2e0a | 0a64 | 6573 | 6967 | 6e5f | 7369 | 7a65 | 7328 | 5b5d | 2c20 | 5b5d | 292e | 0a64 | 6573 |
| 3363220 | 6967 | 6e5f | 7369 | 7a65 | 7328 | 5b44 | 6573 | 6967 | 6e7c | 4465 | 7369 | 676e | 735d | 2c20 | 5b53 | 697a | 657c | 5369 | 7a65 | 735d | 2920 | 3a2d | 0a09 | 6573 |
| 3363300 | 7469 | 6d61 | 7465 | 645f | 7369 | 7a65 | 2844 | 6573 | 6967 | 6e2c | 205b | 5369 | 7a65 | 2c20 | 5f2c | 205f | 5d29 | 2c0a | 0964 | 6573 | 6967 | 6e5f | 7369 | 7a65 |
| 3363360 | 7328 | 4465 | 7369 | 676e | 732c | 2053 | 697a | 6573 | 292e | 0a0a | 0200 | 0ddf | 0000 | 0007 | 0015 | cf82 | 0015 | cf89 | 0000 | 0007 | 0015 | cf95 | 0000 | 0007 |
| 3363440 | 0200 | 0ddf | 0000 | 0007 | 0015 | cfa2 | 0200 | 0ddf | 0000 | 0007 | 0015 | cfaa | 0015 | cfb1 | 0000 | 0007 | 0015 | cfbd | 0000 | 0007 | 0200 | 0ddf | 0000 | 0007 |
| 3363520 | 0015 | cfca | 0200 | 0ddf | 0000 | 0007 | 0015 | cfd2 | 0015 | cfd9 | 0000 | 0007 | 0015 | cfe5 | 0000 | 0007 | 0200 | 0ddf | 0000 | 0007 | 0015 | cff2 | 0200 | 0ddf |
| 3363600 | 0000 | 0007 | 0015 | cffa | 0015 | d001 | 0000 | 0007 | 0015 | d00d | 0000 | 0007 | 0200 | 0ddf | 0000 | 0007 | 0015 | d01a | 0200 | 0ddf | 0000 | 0007 | 0015 | d022 |
| 3363660 | 0015 | d029 | 0000 | 0007 | 0015 | d035 | 0000 | 0007 | 0200 | 0ddf | 0000 | 0007 | 0015 | d042 | 0200 | 0ddf | 0000 | 0007 | 0015 | d04a | 0015 | d051 | 0000 | 0007 |
| 3363740 | 0015 | d05d | 0000 | 0007 | 0200 | 0ddf | 0000 | 0007 | 0015 | d06a | 0200 | 0ddf | 0000 | 0007 | 0015 | d072 | 0015 | d079 | 0000 | 0007 | 0015 | d085 | 0000 | 0007 |
| 3364020 | 0600 | 32df | 0000 | 04d3 | 0014 | 8034 | 0014 | 8038 | 0013 | 8131 | 0014 | 2979 | 0014 | 8044 | 0300 | 2a87 | 0013 | 8148 | 0015 | d0a1 | 0013 | 8150 | 0200 | 0df7 |
| 3364100 | 0015 | d0b0 | 0015 | d0bd | 0200 | 0ad7 | 0015 | d0b4 | 0015 | d0cd | 0300 | 2a87 | 0013 | 8100 | 0014 | 802d | 0013 | 8108 | 0200 | 0df7 | 0000 | 3387 | 0015 | d0e5 |
| 3364160 | 0200 | 0ad7 | 0015 | d0b8 | 0015 | d0f5 | 0000 | 22cf | 0600 | 32df | 0000 | 04db | 0014 | 8060 | 0014 | 8064 | 0013 | 80a1 | 0014 | 29fd | 0014 | 8070 | 0300 | 2a87 |

```
3364240  0013 80b8 0015 d111 0013 80c0 0200 0df7 0015 d120 0015 d12d 0200 0ad7 0015 d124 0015 d13d 0300 2a87 0013 8070 0014 8059
3364320  0013 8078 0200 0df7 0000 3387 0015 d155 0200 0ad7 0015 d128 0015 d165 0000 22cf 0200 0ddf 0000 0007 0015 ceb2 0200 0ddf
3364400  0000 0007 0015 ce8a 0200 0ddf 0000 0007 0015 ce62 0200 0ddf 0000 0007 0015 ce3a 0200 0ddf 0000 0007 0015 ce12 0200 0ddf
3364460  0000 0007 0015 cdea 0200 0ddf 0000 0007 0015 cdc2 0200 0ddf 0015 cd7a 0000 0007 0014 2a95 0015 d1f2 0014 2b19 0015 d1fa
3364540  0014 2b5d 0000 0007 0014 2be1 0000 0007 0200 0ddf 0015 d1e2 0000 0007 0200 0ddf 0015 d1ea 0000 0007 0015 d201 0000 0007
3364620  0015 d20d 0000 0007 0200 0ddf 0000 0007 0015 d21a 0200 0ddf 0000 0007 0015 d222 0015 d229 0000 0007 0015 d235 0000 0007
3364700  0200 0ddf 0000 0007 0015 d242 0200 0ddf 0000 0007 0015 d24a 0015 d251 0000 0007 0015 d25d 0000 0007 0200 0ddf 0000 0007
3364760  0015 d26a 0200 0ddf 0000 0007 0015 d272 0015 d279 0000 0007 0015 d285 0000 0007 0200 0ddf 0000 0007 0015 d292 0200 0ddf
3365040  0000 0007 0015 d29a 0015 d2a1 0000 0007 0015 d2ad 0000 0007 0200 0ddf 0000 0007 0015 d2ba 0200 0ddf 0000 0007 0015 d2c2
3365120  0015 d2c9 0000 0007 0015 d2d5 0000 0007 0200 0ddf 0000 0007 0015 d2e2 0200 0ddf 0000 0007 0015 d2ea 0015 d2f1 0000 0007
3365200  0015 d2fd 0000 0007 0200 0ddf 0000 0007 0015 d30a 0200 0ddf 0000 0007 0015 d312 0015 d319 0000 0007 0015 d325 0000 0007
3365260  0600 32df 0000 04e3 0014 808c 0014 8090 0013 8011 0014 2a81 0014 809c 0300 2a87 0013 8028 0015 d341 0013 8030 0200 0df7
3365340  0015 d350 0015 d35d 0200 0ad7 0015 d354 0015 d36d 0300 2a87 0013 7fe0 0014 8085 0013 7fe8 0200 0df7 0000 3387 0015 d385
3365420  0200 0ad7 0015 d358 0015 1395 0000 22cf 0600 32df 0000 04eb 0014 80b8 0014 80bc 0013 7f81 0014 2b05 0014 80c8 0300 2a87
3365500  0013 7f98 0015 d3b1 0013 7fa0 0200 0df7 0015 d3c0 0015 d3cd 0200 0ad7 0015 d3c4 0015 d3dd 0300 2a87 0013 7f50 0014 80b1
3365560  0013 7f58 0200 0df7 0000 3387 0015 d3f5 0200 0ad7 0015 d3c8 0015 d405 0000 22cf 0200 0ddf 0000 0007 0015 8faa 0200 0ddf
3365640  0000 0007 0015 8f82 0200 0ddf 0000 0007 0015 8f5a 0200 0ddf 0000 0007 0015 8f32 0200 0ddf 0000 0007 0015 8f0a 0200 0ddf
3365720  0000 0007 0015 8ee2 0200 0ddf 0000 0007 0015 8eba 0200 0ddf 0015 8c5e 0015 8e92 0014 2b9d 0015 d49a 0014 2c21 0015 d492
3366000  0014 2c65 0015 d49a 0014 2ca5 0015 d4a2 0014 2ce9 0015 d4aa 0014 2d29 0015 d4b2 0014 2d6d 0015 d4ba 0014 2dad 0015 d4c2
3366060  0014 2df1 0015 d4ca 0014 2e31 0015 d4d2 0014 2e75 0015 d4da 0014 2eb5 0015 d4e2 0014 2ef9 0015 d4ea 0014 2f39 0015 d4f2
3366140  0014 2f7d 0015 d4fa 0014 2fbd 0015 d502 0014 3001 0015 d50a 0014 3041 0015 d512 0014 3085 0015 d51a 0014 30c5 0015 d522
3366220  0014 3109 0015 d52a 0014 3149 0015 d532 0014 318d 0015 d53a 0014 3211 0000 0007 0200 0ddf 0015 8d32 0000 0007 0014 336d
3366300  0015 d556 0014 33f1 0015 d55e 0014 3435 0015 d566 0014 3475 0015 d56e 0014 34b9 0015 d576 0014 34f9 0015 d57e 0014 353d
3366360  0015 d58e 0014 357d 0015 d596 0014 35c1 0000 0007 0014 3601 0015 d59e 0014 3645 0015 d5a6 0014 3685 0015 d5ae 0014 36c9
3366440  0015 d5b6 0014 3709 0015 d5be 0014 374d 0015 d5c6 0014 378d 0015 d5ce 0014 37d1 0015 d5d6 0014 3811 0015 d5de 0014 3855
3366520  0015 d5e6 0014 3895 0015 d5ee 0014 38d9 0015 d5f6 0014 3919 0015 d5fe 0014 395d 0015 d606 0014 399d 0015 d60e 0014 39e1
3366600  0015 d616 0014 3a21 0015 d61e 0014 3a65 0015 d626 0014 3aa5 0015 d62e 0014 3ae9 0015 d636 0014 3b29 0015 d63e 0014 3b6d
3366660  0015 d646 0014 3bad 0015 d64e 0014 3bf1 0015 d656 0014 3c31 0015 d65e 0014 3c75 0015 d666 0014 3cb5 0015 d66e 0014 3cf9
3366740  0015 d676 0014 3d39 0015 d67e 0014 3d7d 0015 d686 0014 3e01 0000 0007 0200 0ddf 0015 d54e 0000 0007 0200 0ddf 0015 d586
3367020  0000 0007 0015 d68d 0000 0007 0015 d699 0000 0007 0200 0ddf 0015 d482 0015 d6a6 0200 0ddf 0000 0007 0015 d6ae 0015 d6b5
3367100  0000 0007 0015 d6c1 0000 0007 0200 0ddf 0000 0007 0015 d6ce 0200 0ddf 0000 0007 0015 d6d6 0015 d6dd 0000 0007 0015 d6e9
3367160  0000 0007 0200 0ddf 0000 0007 0015 d6f6 0200 0ddf 0000 0007 0015 d6fe 0015 d705 0000 0007 0015 d711 0000 0007 0200 0ddf
3367240  0000 0007 0015 d71e 0200 0ddf 0000 0007 0015 d726 0015 d72d 0000 0007 0015 d739 0000 0007 0200 0ddf 0000 0007 0015 d746
3367320  0200 0ddf 0000 0007 0015 d74e 0015 d755 0000 0007 0015 d761 0000 0007 0200 0ddf 0000 0007 0015 d76e 0200 0ddf 0000 0007
3367400  0015 d776 0015 d77d 0000 0007 0015 d789 0000 0007 0200 0ddf 0000 0007 0015 d796 0200 0ddf 0000 0007 0015 d79e 0015 d7a5
3367460  0000 0007 0015 d7b1 0000 0007 0200 0ddf 0000 0007 0015 d7be 0200 0ddf 0000 0007 0015 d7c6 0015 d7cd 0000 0007 0015 d7d9
3367540  0000 0007 0200 0ddf 0000 0007 0015 d7be 0200 0ddf 0000 0007 0015 d796 0200 0ddf 0000 0007 0015 d76e 0200 0ddf 0000 0007
3367620  0015 d746 0200 0ddf 0000 0007 0015 d71e 0200 0ddf 0000 0007 0015 d6f6 0200 0ddf 0000 0007 0015 d6ce 0200 0ddf 0015 d482
3367700  0015 d6a6 0014 2b9d 0015 d85e 0014 2c21 0015 d866 0014 2c65 0015 d96e 0014 2ca5 0015 d876 0014 2ce9 0015 d87e 0014 2d29
3367760  0015 d886 0014 2d6d 0015 d88e 0014 2dad 0015 d896 0014 2df1 0015 d89e 0014 2e31 0015 d8a6 0014 2e75 0015 d8ae 0014 2eb5
3370040  0015 d8b6 0014 2ef9 0015 d8be 0014 2f39 0015 d8c6 0014 2f7d 0015 d8d6 0014 2fbd 0015 d8de 0014 3001 0000 0007 0014 3041
3370120  0015 d8e6 0014 3085 0015 d8ee 0014 30c5 0015 d8f6 0014 3109 0015 d8fe 0014 3149 0015 d906 0014 318d 0015 d90e 0014 3211
3370200  0000 0007 0200 0ddf 0015 d54e 0000 0007 0014 336d 0015 d92a 0014 33f1 0015 d932 0014 3435 0015 d93a 0014 3475 0015 d942
3370260  0014 34b9 0015 d94a 0014 34f9 0015 d952 0014 353d 0015 d95a 0014 35c1 0000 0007 0200 0ddf 0000 0007 0000 0007 0200 0ddf
3370340  0015 d922 0000 0007 0000 0007 0000 0007 0015 d96d 0000 0007 0200 0ddf 0015 d856 0000 0007 0200 0ddf 0015 d9ce 0015 d982
3370420  0015 d989 0000 0007 0015 d995 0000 0007 0200 0ddf 0000 0007 0015 d9a2 0200 0ddf 0000 0007 0015 d9aa 0015 d9b1 0000 0007
3370500  0015 d9bd 0000 0007 0200 0ddf 0000 0007 0015 d9ca 0200 0ddf 0000 0007 0015 d9d2 0015 d9d9 0000 0007 0015 d9e5 0000 0007
3370560  0200 0ddf 0000 0007 0015 d9f2 0200 0ddf 0000 0007 0015 d9fa 0015 da01 0000 0007 0015 da0d 0000 0007 0200 0ddf 0000 0007
3370640  0015 da1a 0200 0ddf 0000 0007 0015 da22 0015 da29 0000 0007 0015 da35 0000 0007 0200 0ddf 0000 0007 0015 da42 0200 0ddf
3370720  0000 0007 0015 da4a 0015 da51 0000 0007 0015 da5d 0000 0007 0200 0ddf 0000 0007 0015 da6a 0200 0ddf 0000 0007 0015 da72
3371000  0015 da79 0000 0007 0015 da85 0000 0007 0200 0ddf 0000 0007 0015 da92 0200 0ddf 0000 0007 0015 da9a 0015 daa1 0000 0007
3371060  0015 daad 0000 0007 0200 0ddf 0000 0007 0015 da92 0200 0ddf 0000 0007 0015 da6a 0200 0ddf 0000 0007 0015 da42 0200 0ddf
3371140  0000 0007 0015 da1a 0200 0ddf 0000 0007 0015 d9f2 0200 0ddf 0000 0007 0015 d9ca 0200 0ddf 0000 0007 0015 d9a2 0200 0ddf
3371220  0015 d856 0000 0007 0014 2b9d 0015 db32 0014 2c21 0015 db3a 0014 2c65 0015 db42 0014 2ca5 0015 db4a 0014 2ce9 0015 db52
3371300  0014 2d29 0015 db5a 0014 2d6d 0015 db6a 0014 2dad 0015 db72 0014 2df1 0000 0007 0014 2e31 0015 db7a 0014 2e75 0015 db82
```

```
3371360  0014 2eb5 0015 db8a 0014 2ef9 0015 db92 0014 2f39 0015 db9a 0014 2f7d 0015 dba2 0014 3001 0000 0007 0200 0ddf 0015 db2a
3371440  0000 0007 0200 0ddf 0015 db62 0000 0007 0015 dba9 0000 0007 0015 dbb5 0000 0007 0200 0ddf 0000 0007 0015 dbc2 0200 0ddf
3371520  0000 0007 0015 dbca 0015 dbd1 0000 0007 0015 dbdd 0000 0007 0200 0ddf 0000 0007 0015 dbea 0200 0ddf 0000 0007 0015 dbf2
3371600  0015 dbf9 0000 0007 0015 dc05 0000 0007 0200 0ddf 0000 0007 0015 dc12 0200 0ddf 0000 0007 0015 dc1a 0015 dc21 0000 0007
3371660  0015 dc2d 0000 0007 0200 0ddf 0000 0007 0015 dc3a 0200 0ddf 0000 0007 0015 dc42 0015 dc49 0000 0007 0015 dc55 0000 0007
3371740  0200 0ddf 0000 0007 0015 dc62 0200 0ddf 0000 0007 0015 dc6a 0015 dc71 0000 0007 0015 dc7d 0000 0007 0200 0ddf 0000 0007
3372020  0015 dc8a 0200 0ddf 0000 0007 0015 dc92 0015 dc99 0000 0007 0015 dca5 0000 0007 0200 0ddf 0000 0007 0015 dcb2 0200 0ddf
3372100  0000 0007 0015 dcba 0015 dcc1 0000 0007 0015 dccd 0000 0007 0200 0ddf 0000 0007 0015 dcb2 0200 0ddf 0000 0007 0015 dd2c
3372160  0000 002c b288 b66c 0000 0fdf 7fff ffff 0016 454c 0200 0db5 0100 15ad 0100 33fd 0000 000b 0000 315f 0015 dd58 0000 002c
3372240  b288 b66c 0000 0fdf 7fff ffff 0015 dd04 0200 0db5 0100 15a1 0100 33fd 0000 000b 0000 315f 0015 dd90 0000 0038 b27c b66c
3372320  0000 0fe0 0000 0ff0 0015 deb8 0200 0db5 0500 1cdd 0000 7637 0000 0003 0000 3287 00b2 20e3 0000 03c3 0000 315f 0015 deb4
3372400  0000 002c b4f0 b4e4 0000 0fdf 7fff ffff 0009 b0dd 0000 0000 0000 0000 0015 e98c 0002 438a 0016 4c24 2c78 00f8 0002 438a
3372460  2520 247c 0016 4588 000c 4408 0200 3d5f 4b8c 0000 0000 0fa3 4b8c 0000 0000 0fa3 4254 0000 0000 6de7 447c 0000 0100 0e4f
3372540  4b8c 0000 0000 764f 24d0 0000 0016 45a8 000c 41e8 0000 3d67 447c 0000 0100 0e4f 4b8c 0000 0000 764f 24d0 0000 0008 dd5c
3372620  000c 41e8 0000 2ae7 447c 0000 0100 0e4f 4b8c 0000 0000 764f 24d0 0000 0008 dd5c 000c 41fc 0000 2aa7 4254 0000 0000 7657
3372700  447c 0000 0100 0e4f 4b8c 0000 0000 764f 24d0 0000 0008 dd9c 000c 43c0 0100 0e4f 4b8c 0000 0000 764f 44c4 0000 0300 7667
3372760  6b74 4af8 0000 766f 4b8c 0000 0000 0003 4254 0000 0000 765f 447c 0000 0100 0e4f 4b8c 0000 0000 764f 242c 0000 0008 dd9c
3373040  0015 df1c 0000 0038 b27c b66c 0000 0fe1 0000 0ff1 0015 df20 0200 0db5 0500 1cdd 0000 763f 0000 0003 0000 3287 00b2 2c43
3373120  0000 03c3 0000 315f 2c78 0030 0002 438a 44a0 0000 0200 6f87 4b8c 0000 0000 7677 5fa0 43c0 0200 0daf 4b8c 0000 0000 6e3f
3373200  6bb4 22bc 0008 db9c 0015 e0f4 0000 0070 b27c b66c 0000 0fe2 0000 0ff2 0015 df58 0200 0db5 0500 1cdd 0000 766f 0000 0013
3373260  0000 3287 00b2 2f03 0000 03c3 0000 315f 0015 e0f4 0000 0038 b27c b66c 0000 0fe3 0000 0ff3 0015 e0f8 0200 0db5 0500 1cdd
3373340  0000 7687 0000 0013 0000 3287 00b2 32a3 0000 03c3 0000 315f 2c78 013c 0002 438a 45e8 0020 4728 0024 3310 3c9c 0000 0020
3373420  0014 0eb0 0028 33f4 320c 3c9c 0000 0020 0014 0e28 0028 33d8 320c 3c9c 0000 0020 0014 0e7c 0028 3380 001c 3c9c 0000 0020
3373500  0014 12b0 0028 43e4 0100 3d4f 6e1c 0024 329c 247c 000b 43b0 0024 4408 0200 3d5f 4b8c 0000 0000 0c83 4b8c 0000 0000 0643
3373560  4254 0000 0000 3d5f 3ba0 0000 0008 dd9c 0024 41e8 0000 2ae7 3ba0 0000 0008 dd5c 0024 41e8 0000 3d67 3ba0 0000 0008 dd5c
3373640  0024 37f0 447c 0000 0200 0daf 4b8c 0000 0000 5eef 6e1c 0020 24d0 0000 0016 46ac 0020 37f0 447c 0000 0200 0daf 4b8c 0000
3373720  0000 7697 6e1c 001c 24d0 0000 0016 46ac 001c 37f0 447c 0000 0200 0daf 4b8c 0000 0000 769f 6dd8 247c 0016 46ac 0018 37f0
3374000  447c 0000 0200 0daf 4b8c 0000 0000 76a7 6d94 247c 0016 46ac 0014 3d30 447c 0000 0200 0daf 4b8c 0000 0000 3d5f 6d0c 234c
3374060  0016 46ac 0027 2020 2020 2053 7461 7274 696e 6720 4368 6970 5369 7a65 722e 2050 6c65 6173 6520 5761 6974 2e2e 2e00 7465
3374140  0015 e44c 0000 0038 b27c b66c 0000 0fe4 0000 0ff4 0015 e450 0200 0db5 0500 1cdd 0000 76af 0000 0013 0000 3287 00b2 37e3
3374220  0000 03c3 0000 315f 27f0 00f0 0015 e24c 4e70 0000 0000 3d4f 2520 33a0 4254 0000 0000 2027 24d0 0000 0008 c35c 001c 43e4
3374300  0100 0e4f 4b8c 0000 0000 76b7 3b4c 0000 000b 19ec 001c 3229 3364 39a4 0016 4634 001c 32b8 4e1c 0000 0000 731f 4300 0000
3374360  0000 76bf 0008 ec1c 001c 247c 0008 d13c 001c 3804 4538 6dd8 5370 247c 0015 ab3c 0018 2e7c ada8 2ba0 0018 0040 4538 4af8
3374440  0000 76c7 5370 4550 6d94 6b74 4538 4af8 0000 743f 6bb4 247c 0015 3d5c 0014 aa34 2e98 42ac 00c0 71c7 0008 ec1c 0010 247c
3374520  0008 d13c 0010 2c88 001a 2c58 4300 0000 0000 71cf 0008 ec1c 0010 247c 0008 d13c 0010 43e4 0100 0e4f 4b8c 0000 0000 76cf
3374600  3cf4 234c 000b 19ec 0030 2020 2020 2057 7269 7469 6e67 2052 542d 6c65 7665 6c20 6172 6368 6974 6563 7475 7265 2074 6f20
3374660  6669 6c65 3a20 7e77 7e6e 0075 28c4 00c4 0015 e310 4e70 0000 0000 76d7 2520 33a0 4254 0000 0000 2027 24d0 0000 0008 c35c
3374740  0020 43e4 0100 0e4f 4b8c 0000 0000 76b7 3b4c 0000 000b 19ec 0020 3410 001c 3348 3b4c 0000 0016 4634 0020 3364 4568 4af8
3375020  0000 76df 5370 4538 6e1c 001c 6bf4 247c 0015 366c 001c 33bc 4254 0000 0000 3387 3c48 0000 0008 d3dc 001c 4550 6dd8 5370
3375100  4300 0000 0000 76e7 0008 c0fc 0018 3d3c 1ba0 0000 0016 4774 0014 39f8 0008 c09c 0014 4078 0008 b95c 0010 43e4 0100 0e4f
3375160  4b8c 0000 0000 76cf 3cf4 234c 000b 19ec 2954 0138 0002 438a 4e70 0000 0000 76f7 2520 33a0 4254 0000 0000 2027 24d0 0000
3375240  0008 c35c 0028 43e4 0100 0e4f 4b8c 0000 0000 76b7 3b4c 0000 000b 19ec 0028 3410 001c 3380 0024 39a4 0016 4634 0028 3364
3375320  4568 4af8 0000 76df 5370 4538 6e1c 001c 6bf4 247c 0015 366c 0028 3410 0020 41e8 0000 3387 3c48 0000 0008 d3dc 0028 4550
3375400  6dd8 5370 4300 0000 0000 76e7 0008 c0fc 0028 3e70 0024 3c9c 0000 0020 0016 4774 0024 3c9c 0000 0020 0008 c09c 0024 411c
3375460  0000 0020 0008 b95c 0020 43e4 0100 0e4f 4b8c 0000 0000 76b7 3b4c 0000 000b 19ec 0020 332c 4568 4af8 0000 76ff 5370 4538
3375540  6e1c 001c 6bf4 247c 0015 366c 001c 2e7c adec 2ba0 001c 0028 37f0 40a0 0016 47dc 0018 aa50 2e98 4550 6d50 5370 4300 0000
3375620  0000 770f 0008 c0fc 0010 2c89 0004 2c58 44a0 0000 0100 0e4f 4b8c 0000 0000 76cf 3cf4 234c 000b 19ec 0015 e580 0000 00a8
3375700  b27c b66c 0000 0fe5 0000 0ff5 0015 e488 0200 0db5 0500 1cdd 0000 767f 0000 001b 0000 3287 00b2 31a3 0000 03c3 0000 315f
3375760  0015 e4bc 0000 0038 b27c b66c 0000 0fe6 0000 0ff6 0015 e4c0 0200 0db5 0500 1cdd 0000 7717 0000 0003 0000 3287 00b2 40e3
3376040  0000 03c3 0000 315f 0015 e580 0000 0038 b27c b66c 0000 0fe7 0000 0ff7 0015 e584 0200 0db5 0500 1cdd 0000 7717 0000 000b
3376120  0000 3287 00b2 4363 0000 03c3 0000 315f 2c78 008c 0002 438a 45b8 42ac 0000 771f 0008 ec1c 001c 247c 0008 d13c 001c 247c
3376200  0016 441c 001c 43e4 0300 767f 5f78 43c0 0200 0daf 4b8c 0000 0000 3287 6bb4 247c 0008 db9c 001c 42ac 0000 7727 0008 ec1c
3376260  001c 247c 0008 d13c 001c 320c 3574 4cc4 0000 0fa3 332c 4cc4 0000 04b3 a858 aa34 9eb8 ae30 3348 39a4 0016 48e8 001c 38e8
3376340  3d6c 3d30 2420 0000 0016 4908 0015 e5fc 0000 0038 b27c b66c 0000 0fe8 0000 0ff8 0015 e600 0200 0db5 0500 1cdd 0000 7717
3376420  0000 0023 0000 3287 00b2 4843 0000 03c3 0000 315f 2c78 0044 0002 438a 56f8 66c0 0028 0024 bfcc a874 aab4 0002 9eb8 ad18
```

| | | | | | | | | | | | | | | | | | | | | | | | | |
|---|---|---|---|---|---|---|---|---|---|---|---|---|---|---|---|---|---|---|---|---|---|---|---|---|
| 3376500 | 001c | a874 | aab4 | 0002 | 9eb8 | ad18 | 0020 | 4290 | 0000 | 0018 | 0000 | 0003 | 4538 | 6c84 | 0028 | 6c84 | 0024 | 22bc | 0016 | 4934 | 0015 | e6d0 | 0000 | 0038 |
| 3376560 | b27c | b66c | 0000 | 0fe9 | 0000 | 0ff9 | 0015 | e6d4 | 0200 | 0db5 | 0500 | 1cdd | 0000 | 7717 | 0000 | 003b | 0000 | 3287 | 00b2 | 49a3 | 0000 | 03c3 | 0000 | 315f |
| 3376640 | 28c4 | 096c | 0015 | e69c | 56f8 | 671c | 682c | 46ec | 4768 | 47e4 | 4880 | 0018 | 0020 | 4880 | 001c | 0024 | 4880 | 0020 | 001c | aa88 | 0020 | aa6c | a354 | 394c |
| 3376720 | 0018 | 38c0 | 3894 | 001c | 382c | 0024 | 2430 | 0000 | 0016 | 49d4 | 0028 | aa88 | 0024 | aa34 | 9d88 | ad18 | 001c | aa88 | 0020 | aaf0 | 0001 | ad18 | 0018 | 2ecc |
| 3377000 | 3984 | 0020 | 001c | 2304 | 0016 | 4934 | 2954 | 0030 | 0002 | 438a | a874 | aab4 | 0002 | 9eb8 | ad18 | 001c | a8c8 | 0020 | a874 | 9d88 | ad18 | 0020 | 4224 | 0018 |
| 3377060 | 0000 | 0003 | 239c | 0000 | 0016 | 4934 | 0015 | e910 | 0000 | 0038 | b27c | b66c | 0000 | 0fea | 0000 | 0ffa | 0015 | e914 | 0200 | 0db5 | 0500 | 1cdd | 0000 | 7737 |
| 3377140 | 0000 | 002b | 0000 | 3287 | 00b2 | 4ea3 | 0000 | 03c3 | 0000 | 315f | 2c78 | 0208 | 0002 | 438a | 45c4 | 4728 | 0020 | 4790 | 001c | 47f8 | 0034 | 4880 | 0018 | 0038 |
| 3377220 | 4550 | 5fa0 | 5370 | 4538 | 5fa0 | 6bb4 | 4550 | 6af0 | 003c | 6b74 | 3ba0 | 0000 | 0014 | 0eb0 | 0040 | aa88 | 003c | aa88 | 0038 | 9e0c | aa88 | 0034 | 9de0 | abb8 |
| 3377300 | 3f40 | 0000 | 9de0 | ac08 | 3364 | 247c | 0016 | 44a0 | 0034 | 3310 | 4300 | 0000 | 0000 | 7677 | 0015 | 358c | 0034 | 43e4 | 0200 | 387f | 4b8c | 0000 | 0000 | 773f |
| 3377360 | 4b8c | 0000 | 0000 | 0003 | 32f0 | 002c | 24d0 | 0000 | 000b | 43b0 | 0034 | 4550 | 4b8c | 0000 | 0000 | 76f7 | 5370 | 4538 | 4b8c | 0000 | 0000 | 76d7 | 6bb4 | 4598 |
| 3377440 | 0018 | 4af8 | 0000 | 334f | 6b74 | 4210 | 0000 | 76af | 44c4 | 0000 | 0100 | 0e4f | 4b8c | 0000 | 0000 | 764f | 4254 | 0000 | 0000 | 06df | 32f0 | 0030 | 24d0 | 0000 |
| 3377520 | 0016 | 4a74 | 0034 | 3eec | 0030 | 41e8 | 0000 | 774f | 3af4 | 002c | 0008 | dd9c | 0030 | 43e4 | 0200 | 387f | 6d0c | 6e1c | 002c | 32f0 | 0024 | 247c | 000b | 43b0 |
| 3377600 | 002c | 43e4 | 0400 | 7757 | 4b8c | 0000 | 0000 | 0003 | 4b8c | 0000 | 0000 | 0003 | 6dd8 | 6dd8 | 32f0 | 0028 | 24d0 | 0000 | 0008 | cf7c | 002c | 4408 | 0100 | 0e4f |
| 3377660 | 4b8c | 0000 | 0000 | 76cf | 4254 | 0000 | 0000 | 386f | 3af4 | 0028 | 0008 | dd9c | 002c | 41fc | 0000 | 002b | 4254 | 0000 | 0000 | 775f | 3af4 | 0028 | 0008 | dd9c |
| 3377740 | 002c | 3eec | 0028 | 41e8 | 0000 | 1d17 | 3af4 | 0024 | 0008 | dd9c | 0028 | 43e4 | 0300 | 7767 | 6e1c | 0024 | 6e1c | 0020 | 6e1c | 001c | 32b8 | 247c | 0008 | cf7c |
| 3400020 | 001c | aa6c | aab4 | 0002 | 9eb8 | ac08 | 44a0 | 0000 | 0400 | 30bf | 6d0c | 6b74 | 6b74 | 4af8 | 0000 | 7777 | 3bf4 | 0000 | 0016 | 4a94 | 0018 | 4408 | 0100 | 0e4f |
| 3400100 | 4b8c | 0000 | 0000 | 764f | 4254 | 0000 | 0000 | 777f | 3bf4 | 0000 | 0008 | dd9c | 0018 | 43e4 | 0300 | 767f | 6d94 | 6d50 | 6d0c | 43c0 | 0200 | 0daf | 4b8c | 0000 |
| 3400160 | 0000 | 3287 | 6bb4 | 234c | 0008 | b2bc | 0015 | e9f4 | 0000 | 00b0 | b27c | b66c | 0000 | 0feb | 0000 | 0ffb | 0015 | e98c | 0200 | 0db5 | 0500 | 1cdd | 0000 | 772f |
| 3400240 | 0000 | 0013 | 0000 | 3287 | 00b2 | 4743 | 0000 | 03c3 | 0000 | 315f | 0015 | e988 | 0000 | 0040 | 0016 | 482c | 0000 | 0000 | 0000 | 0000 | 0016 | 47fd | 0016 | 4a44 |
| 3400320 | 0000 | 0000 | 0000 | 0000 | 0000 | 0000 | 0000 | 0000 | 0000 | 0000 | 0000 | 0000 | 0016 | 43ac | 0000 | 0000 | 0016 | 47ec | 0015 | e9f4 | 0000 | 0038 | b130 | b66c |
| 3400400 | 0000 | 0fec | 0000 | 0ffc | 0015 | dd95 | 0200 | 0db5 | 0500 | 1cdd | 0000 | 7787 | 0000 | 0013 | 0000 | 3287 | 00b2 | 5723 | 0000 | 03c3 | 0000 | 315f | 2954 | 0034 |
| 3400460 | 0002 | 438a | 56f8 | 671c | 682c | 5758 | 67b8 | 6a00 | 4550 | 5fa0 | 5370 | 4568 | 5fa0 | 6bb4 | 4550 | 6c34 | 6bf4 | 247c | 0014 | 0eb0 | 0014 | 2330 | 0016 | 4ae4 |
| 3400540 | 0015 | fda8 | 0000 | 1314 | 0200 | 0ddf | 0000 | 0007 | 0015 | e9ea | 0200 | 0ddf | 0000 | 0007 | 0015 | e9f2 | 0015 | e9f9 | 0000 | 0007 | 0015 | ea05 | 0000 | 0007 |
| 3400620 | 0200 | 0ddf | 0000 | 0007 | 0015 | ea12 | 0200 | 0ddf | 0000 | 0007 | 0015 | ea1a | 0015 | ea21 | 0000 | 0007 | 0015 | ea2d | 0000 | 0007 | 0600 | 32df | 0000 | 0523 |
| 3400700 | 0014 | 81ec | 0014 | 81f0 | 0013 | 7b91 | 0014 | 2ea1 | 0014 | 81fc | 0300 | 2a87 | 0013 | 7ba8 | 0015 | ea49 | 0013 | 7bb0 | 0200 | 0df7 | 0015 | ea58 | 0015 | ea65 |
| 3400760 | 0200 | 0ad7 | 0015 | ea5c | 0015 | ea75 | 0300 | 2a87 | 0013 | 7b60 | 0014 | 81e5 | 0013 | 7b68 | 0200 | 0df7 | 0000 | 3387 | 0015 | ea8d | 0200 | 0ad7 | 0015 | ea60 |
| 3401040 | 0015 | ea9d | 0000 | 22cf | 0600 | 32df | 0000 | 052b | 0014 | 8218 | 0014 | 821c | 0013 | 7b01 | 0014 | 2f25 | 0014 | 8228 | 0300 | 2a87 | 0013 | 7b18 | 0015 | eab9 |
| 3401120 | 0013 | 7b20 | 0200 | 0df7 | 0015 | eac8 | 0015 | ead5 | 0200 | 0ad7 | 0015 | eacc | 0015 | eae5 | 0300 | 2a87 | 0013 | 7ad0 | 0014 | 8211 | 0013 | 7ad8 | 0200 | 0df7 |
| 3401200 | 0000 | 3387 | 0015 | eafd | 0200 | 0ad7 | 0015 | ead0 | 0015 | eb0d | 0000 | 22cf | 0200 | 0ddf | 0000 | 0007 | 0015 | da9a | 0200 | 0ddf | 0000 | 0007 | 0015 | da72 |
| 3401260 | 0200 | 0ddf | 0000 | 0007 | 0015 | da4a | 0200 | 0ddf | 0000 | 0007 | 0015 | da22 | 0200 | 0ddf | 0000 | 0007 | 0015 | d9fa | 0200 | 0ddf | 0000 | 0007 | 0015 | d9d2 |
| 3401340 | 0200 | 0ddf | 0000 | 0007 | 0015 | d9aa | 0200 | 0ddf | 0015 | d9ce | 0015 | d982 | 0014 | 2fbd | 0015 | eb92 | 0014 | 3041 | 0015 | eb9a | 0014 | 3085 | 0015 | eba2 |
| 3401420 | 0014 | 30c5 | 0015 | ebaa | 0014 | 3109 | 0015 | ebb2 | 0014 | 3149 | 0015 | ebba | 0014 | 318d | 0015 | ebc2 | 0014 | 3211 | 0000 | 0007 | 0200 | 0ddf | 0015 | d922 |
| 3401500 | 0000 | 0007 | 0014 | 336d | 0015 | ebde | 0014 | 33f1 | 0015 | ebe6 | 0014 | 3435 | 0015 | ebee | 0014 | 3475 | 0015 | ebf6 | 0014 | 34b9 | 0015 | ebfe | 0014 | 34f9 |
| 3401560 | 0015 | ec06 | 0014 | 353d | 0015 | ec0e | 0014 | 35c1 | 0000 | 0007 | 0200 | 0ddf | 0000 | 0007 | 0000 | 0007 | 0200 | 0ddf | 0015 | ebd6 | 0000 | 0007 | 0000 | 0007 |
| 3401640 | 0000 | 0007 | 0015 | ec21 | 0000 | 0007 | 0200 | 0ddf | 0015 | eb8a | 0000 | 0007 | 0200 | 0ddf | 0000 | 0007 | 0015 | ec36 | 0015 | ec3d | 0000 | 0007 | 0015 | ec49 |
| 3401720 | 0000 | 0007 | 0200 | 0ddf | 0000 | 0007 | 0015 | ec56 | 0200 | 0ddf | 0000 | 0007 | 0015 | ec5e | 0015 | ec65 | 0000 | 0007 | 0015 | ec71 | 0000 | 0007 | 0200 | 0ddf |
| 3402000 | 0000 | 0007 | 0015 | ec7e | 0200 | 0ddf | 0000 | 0007 | 0015 | ec86 | 0015 | ec8d | 0000 | 0007 | 0015 | ec99 | 0000 | 0007 | 0200 | 0ddf | 0000 | 0007 | 0015 | eca6 |
| 3402060 | 0200 | 0ddf | 0000 | 0007 | 0015 | ecae | 0015 | ecb5 | 0000 | 0007 | 0015 | ecc1 | 0000 | 0007 | 0200 | 0ddf | 0000 | 0007 | 0015 | ecce | 0200 | 0ddf | 0000 | 0007 |
| 3402140 | 0015 | ecd6 | 0015 | ecdd | 0000 | 0007 | 0015 | ece9 | 0000 | 0007 | 0200 | 0ddf | 0000 | 0007 | 0015 | ecf6 | 0200 | 0ddf | 0000 | 0007 | 0015 | ecfe | 0015 | ed05 |
| 3402220 | 0000 | 0007 | 0015 | e111 | 0000 | 0007 | 0200 | 0ddf | 0000 | 0007 | 0015 | ed1e | 0200 | 0ddf | 0000 | 0007 | 0015 | ed26 | 0015 | ed2d | 0000 | 0007 | 0015 | ed39 |
| 3402300 | 0000 | 0007 | 0200 | 0ddf | 0000 | 0007 | 0015 | ed46 | 0200 | 0ddf | 0000 | 0007 | 0015 | ed4e | 0015 | ed55 | 0000 | 0007 | 0015 | ed61 | 0000 | 0007 | 0200 | 0ddf |
| 3402360 | 0000 | 0007 | 0015 | e146 | 0200 | 0ddf | 0000 | 0007 | 0015 | e11e | 0200 | 0ddf | 0000 | 0007 | 0015 | ecf6 | 0200 | 0ddf | 0000 | 0007 | 0015 | ecce | 0200 | 0ddf |
| 3402440 | 0000 | 0007 | 0015 | eca6 | 0200 | 0ddf | 0000 | 0007 | 0015 | ec7e | 0200 | 0ddf | 0000 | 0007 | 0015 | ec56 | 0200 | 0ddf | 0015 | eb8a | 0000 | 0007 | 0014 | 2fbd |
| 3402520 | 0015 | ede6 | 0014 | 3041 | 0015 | edee | 0014 | 3085 | 0015 | edfe | 0014 | 30c5 | 0015 | ee06 | 0014 | 3109 | 0000 | 0007 | 0014 | 3149 | 0015 | ee0e | 0014 | 318d |
| 3402600 | 0015 | ee16 | 0014 | 3211 | 0000 | 0007 | 0200 | 0ddf | 0015 | edde | 0000 | 0007 | 0200 | 0ddf | 0015 | edf6 | 0000 | 0007 | 0015 | ee1d | 0000 | 0007 | 0015 | ee29 |
| 3402660 | 0000 | 0007 | 0200 | 0ddf | 0000 | 0007 | 0015 | ee36 | 0200 | 0ddf | 0000 | 0007 | 0015 | ee3e | 0015 | ee45 | 0000 | 0007 | 0015 | ee51 | 0000 | 0007 | 0200 | 0ddf |
| 3402740 | 0000 | 0007 | 0015 | ee5e | 0200 | 0ddf | 0000 | 0007 | 0015 | ee66 | 0015 | ee6d | 0000 | 0007 | 0015 | ee79 | 0000 | 0007 | 0200 | 0ddf | 0000 | 0007 | 0015 | ee86 |
| 3403020 | 0200 | 0ddf | 0000 | 0007 | 0015 | ee8e | 0015 | ee95 | 0000 | 0007 | 0015 | eea1 | 0000 | 0007 | 0200 | 0ddf | 0000 | 0007 | 0015 | eeae | 0200 | 0ddf | 0000 | 0007 |
| 3403100 | 0015 | eeb6 | 0015 | eebd | 0000 | 0007 | 0015 | eec9 | 0000 | 0007 | 0200 | 0ddf | 0000 | 0007 | 0015 | eed6 | 0200 | 0ddf | 0000 | 0007 | 0015 | eede | 0015 | eee5 |
| 3403160 | 0000 | 0007 | 0015 | eef1 | 0000 | 0007 | 0200 | 0ddf | 0000 | 0007 | 0015 | eefe | 0200 | 0ddf | 0000 | 0007 | 0015 | ef06 | 0015 | ef0d | 0000 | 0007 | 0015 | ef19 |
| 3403240 | 0000 | 0007 | 0200 | 0ddf | 0000 | 0007 | 0015 | ef26 | 0200 | 0ddf | 0000 | 0007 | 0015 | ef2e | 0015 | ef35 | 0000 | 0007 | 0015 | ef41 | 0000 | 0007 | 0200 | 0ddf |
| 3403320 | 0000 | 0007 | 0015 | ef26 | 0200 | 0ddf | 0000 | 0007 | 0015 | eefe | 0200 | 0ddf | 0000 | 0007 | 0015 | eed6 | 0200 | 0ddf | 0000 | 0007 | 0015 | eeae | 0200 | 0ddf |
| 3403400 | 0000 | 0007 | 0015 | ee86 | 0200 | 0ddf | 0000 | 0007 | 0015 | ee5e | 0200 | 0ddf | 0000 | 0007 | 0015 | ee36 | 0200 | 0ddf | 0015 | edde | 0000 | 0007 | 0014 | 2fbd |
| 3403460 | 0015 | efce | 0014 | 3041 | 0015 | efd6 | 0014 | 3085 | 0000 | 0007 | 0014 | 3109 | 0000 | 0007 | 0200 | 0ddf | 0015 | efbe | 0000 | 0007 | 0200 | 0ddf | 0015 | efc6 |
| 3403540 | 0000 | 0007 | 0015 | efdd | 0000 | 0007 | 0015 | efe9 | 0000 | 0007 | 0200 | 0ddf | 0000 | 0007 | 0015 | eff6 | 0200 | 0ddf | 0000 | 0007 | 0015 | effe | 0015 | f005 |

| | | | | | | | | | | | | | | | | | | | | | | | | |
|---|---|---|---|---|---|---|---|---|---|---|---|---|---|---|---|---|---|---|---|---|---|---|---|---|
| 3403620 | 0000 | 0007 | 0015 | f011 | 0000 | 0007 | 0200 | 0ddf | 0000 | 0007 | 0015 | f01e | 0200 | 0ddf | 0000 | 0007 | 0015 | f026 | 0015 | f02d | 0000 | 0007 | 0015 | f039 |
| 3403700 | 0000 | 0007 | 0200 | 0ddf | 0000 | 0007 | 0015 | f046 | 0200 | 0ddf | 0000 | 0007 | 0015 | f04e | 0015 | f055 | 0000 | 0007 | 0015 | f061 | 0000 | 0007 | 0200 | 0ddf |
| 3403760 | 0000 | 0007 | 0015 | f06e | 0200 | 0ddf | 0000 | 0007 | 0015 | f076 | 0015 | f07d | 0000 | 0007 | 0015 | f089 | 0000 | 0007 | 0200 | 0ddf | 0000 | 0007 | 0015 | f096 |
| 3404040 | 0200 | 0ddf | 0000 | 0007 | 0015 | f09e | 0015 | f0a5 | 0000 | 0007 | 0015 | f0b1 | 0000 | 0007 | 0200 | 0ddf | 0000 | 0007 | 0015 | f0be | 0200 | 0ddf | 0000 | 0007 |
| 3404120 | 0015 | f0c6 | 0015 | f0cd | 0000 | 0007 | 0015 | f0d9 | 0000 | 0007 | 0200 | 0ddf | 0000 | 0007 | 0015 | f0e6 | 0200 | 0ddf | 0000 | 0007 | 0015 | f0ee | 0015 | f0f5 |
| 3404200 | 0000 | 0007 | 0015 | f101 | 0000 | 0007 | 0600 | 32df | 0000 | 0533 | 0014 | 8244 | 0014 | 8248 | 0013 | 7a71 | 0014 | 2fa9 | 0014 | 8254 | 0300 | 2a87 | 0013 | 7a88 |
| 3404260 | 0015 | f11d | 0013 | 7a90 | 0200 | 0df7 | 0015 | f12c | 0015 | f139 | 0200 | 0ad7 | 0015 | f130 | 0015 | f149 | 0300 | 2a87 | 0013 | 7a40 | 0014 | 823d | 0013 | 7a48 |
| 3404340 | 0200 | 0df7 | 0000 | 3397 | 0015 | f161 | 0200 | 0ad7 | 0015 | f134 | 0015 | f171 | 0000 | 22cf | 0600 | 32df | 0000 | 053b | 0014 | 8270 | 0014 | 8274 | 0013 | 79e1 |
| 3404420 | 0014 | 302d | 0014 | 8280 | 0300 | 2a87 | 0013 | 79f8 | 0015 | f18d | 0013 | 7a00 | 0200 | 0df7 | 0015 | f19c | 0015 | f1a9 | 0200 | 0ad7 | 0015 | f1a0 | 0015 | f1b9 |
| 3404500 | 0300 | 2a87 | 0013 | 79b0 | 0014 | 8269 | 0013 | 79b8 | 0200 | 0df7 | 0000 | 3387 | 0015 | f1d1 | 0200 | 0ad7 | 0015 | f1a4 | 0015 | f1e1 | 0000 | 22cf | 0200 | 0ddf |
| 3404560 | 0000 | 0007 | 0015 | ef2e | 0200 | 0ddf | 0000 | 0007 | 0015 | ef06 | 0200 | 0ddf | 0000 | 0007 | 0015 | eede | 0200 | 0ddf | 0000 | 0007 | 0015 | eeb6 | 0200 | 0ddf |
| 3404640 | 0000 | 0007 | 0015 | ee8e | 0200 | 0ddf | 0000 | 0007 | 0015 | ee66 | 0200 | 0ddf | 0000 | 0007 | 0015 | ee3e | 0200 | 0ddf | 0015 | edf6 | 0000 | 0007 | 0014 | 30c5 |
| 3404720 | 0015 | f26e | 0014 | 3149 | 0015 | f276 | 0014 | 318d | 0000 | 0007 | 0014 | 3211 | 0000 | 0007 | 0200 | 0ddf | 0015 | f25e | 0000 | 0007 | 0200 | 0ddf | 0015 | f266 |
| 3405000 | 0000 | 0007 | 0015 | f27d | 0000 | 0007 | 0015 | f289 | 0000 | 0007 | 0200 | 0ddf | 0000 | 0007 | 0015 | f296 | 0200 | 0ddf | 0000 | 0007 | 0015 | f29e | 0015 | f2a5 |
| 3405060 | 0000 | 0007 | 0015 | f2b1 | 0000 | 0007 | 0200 | 0ddf | 0000 | 0007 | 0015 | f2be | 0200 | 0ddf | 0000 | 0007 | 0015 | f2c6 | 0015 | f2cd | 0000 | 0007 | 0015 | f2d9 |
| 3405140 | 0000 | 0007 | 0200 | 0ddf | 0000 | 0007 | 0015 | f2e6 | 0200 | 0ddf | 0000 | 0007 | 0015 | f2ee | 0015 | f2f5 | 0000 | 0007 | 0015 | f301 | 0000 | 0007 | 0200 | 0ddf |
| 3405220 | 0000 | 0007 | 0015 | f30e | 0200 | 0ddf | 0000 | 0007 | 0015 | f316 | 0015 | f31d | 0000 | 0007 | 0015 | f329 | 0000 | 0007 | 0200 | 0ddf | 0000 | 0007 | 0015 | f336 |
| 3405300 | 0200 | 0ddf | 0000 | 0007 | 0015 | f33e | 0015 | f345 | 0000 | 0007 | 0015 | f351 | 0000 | 0007 | 0200 | 0ddf | 0000 | 0007 | 0015 | f35e | 0200 | 0ddf | 0000 | 0007 |
| 3405360 | 0015 | f366 | 0015 | f36d | 0000 | 0007 | 0015 | f379 | 0000 | 0007 | 0200 | 0ddf | 0000 | 0007 | 0015 | f386 | 0200 | 0ddf | 0000 | 0007 | 0015 | f38e | 0015 | f395 |
| 3405440 | 0000 | 0007 | 0015 | f3a1 | 0000 | 0007 | 0600 | 32df | 0000 | 0543 | 0014 | 829c | 0014 | 82a0 | 0013 | 7951 | 0014 | 30b1 | 0014 | 82ac | 0300 | 2a87 | 0013 | 7968 |
| 3405520 | 0015 | f3bd | 0013 | 7970 | 0200 | 0df7 | 0015 | f3cc | 0015 | f3d9 | 0200 | 0ad7 | 0015 | f3d0 | 0015 | f3e9 | 0300 | 2a87 | 0013 | 7920 | 0014 | 8295 | 0013 | 7928 |
| 3405600 | 0200 | 0df7 | 0000 | 3387 | 0015 | f401 | 0200 | 0ad7 | 0015 | f3d4 | 0015 | f411 | 0000 | 22cf | 0600 | 32df | 0000 | 054b | 0014 | 82c8 | 0014 | 82cc | 0013 | 78c1 |
| 3405660 | 0014 | 3135 | 0014 | 82d8 | 0300 | 2a87 | 0013 | 78d8 | 0015 | f42d | 0013 | 78e0 | 0200 | 0df7 | 0015 | f43c | 0015 | f449 | 0200 | 0ad7 | 0015 | f440 | 0015 | f459 |
| 3405740 | 0300 | 2a87 | 0013 | 7890 | 0014 | 82c1 | 0013 | 7898 | 0200 | 0df7 | 0000 | 3387 | 0015 | f471 | 0200 | 0ad7 | 0015 | f444 | 0015 | f481 | 0000 | 22cf | 0200 | 0ddf |
| 3406020 | 0000 | 0007 | 0015 | ed4e | 0200 | 0ddf | 0000 | 0007 | 0015 | ed26 | 0200 | 0ddf | 0000 | 0007 | 0015 | ecfe | 0200 | 0ddf | 0000 | 0007 | 0015 | ecd6 | 0200 | 0ddf |
| 3406100 | 0000 | 0007 | 0015 | ecae | 0200 | 0ddf | 0000 | 0007 | 0015 | ec86 | 0200 | 0ddf | 0000 | 0007 | 0015 | ec5e | 0200 | 0ddf | 0000 | 0007 | 0015 | ec36 | 0200 | 0ddf |
| 3406160 | 0015 | ebd6 | 0000 | 0007 | 0014 | 336d | 0015 | f512 | 0014 | 33f1 | 0015 | f51a | 0014 | 3435 | 0015 | f52a | 0014 | 3475 | 0015 | f532 | 0014 | 34b9 | 0000 | 0007 |
| 3406240 | 0014 | 34f9 | 0015 | f53a | 0014 | 353d | 0015 | f542 | 0014 | 35c1 | 0000 | 0007 | 0200 | 0ddf | 0015 | f50a | 0000 | 0007 | 0200 | 0ddf | 0015 | f522 | 0000 | 0007 |
| 3406320 | 0015 | f549 | 0000 | 0007 | 0015 | f555 | 0000 | 0007 | 0200 | 0ddf | 0000 | 0007 | 0015 | f562 | 0200 | 0ddf | 0000 | 0007 | 0015 | f56a | 0015 | f571 | 0000 | 0007 |
| 3406400 | 0015 | f57d | 0000 | 0007 | 0200 | 0ddf | 0000 | 0007 | 0015 | f58a | 0200 | 0ddf | 0000 | 0007 | 0015 | f592 | 0015 | f599 | 0000 | 0007 | 0015 | f5a5 | 0000 | 0007 |
| 3406460 | 0200 | 0ddf | 0000 | 0007 | 0015 | f5b2 | 0200 | 0ddf | 0000 | 0007 | 0015 | f5ba | 0015 | f5c1 | 0000 | 0007 | 0015 | f5cd | 0000 | 0007 | 0200 | 0ddf | 0000 | 0007 |
| 3406540 | 0015 | f5da | 0200 | 0ddf | 0000 | 0007 | 0015 | f5e2 | 0015 | f5e9 | 0000 | 0007 | 0015 | f5f5 | 0000 | 0007 | 0200 | 0ddf | 0000 | 0007 | 0015 | f602 | 0200 | 0ddf |
| 3406620 | 0000 | 0007 | 0015 | f60a | 0015 | f611 | 0000 | 0007 | 0015 | f61d | 0000 | 0007 | 0200 | 0ddf | 0000 | 0007 | 0015 | f62a | 0200 | 0ddf | 0000 | 0007 | 0015 | f632 |
| 3406700 | 0015 | f639 | 0000 | 0007 | 0015 | f645 | 0000 | 0007 | 0200 | 0ddf | 0000 | 0007 | 0015 | f652 | 0200 | 0ddf | 0000 | 0007 | 0015 | f65a | 0015 | f661 | 0000 | 0007 |
| 3406760 | 0015 | f66d | 0000 | 0007 | 0200 | 0ddf | 0000 | 0007 | 0015 | f67a | 0200 | 0ddf | 0000 | 0007 | 0015 | f682 | 0015 | f689 | 0000 | 0007 | 0015 | f695 | 0000 | 0007 |
| 3407040 | 0200 | 0ddf | 0000 | 0007 | 0015 | f67a | 0200 | 0ddf | 0000 | 0007 | 0015 | f652 | 0200 | 0ddf | 0000 | 0007 | 0015 | f62a | 0200 | 0ddf | 0000 | 0007 | 0015 | f602 |
| 3407120 | 0200 | 0ddf | 0000 | 0007 | 0015 | f5da | 0200 | 0ddf | 0000 | 0007 | 0015 | f5b2 | 0200 | 0ddf | 0000 | 0007 | 0015 | f58a | 0200 | 0ddf | 0000 | 0007 | 0015 | f562 |
| 3407200 | 0200 | 0ddf | 0015 | f50a | 0000 | 0007 | 0014 | 336d | 0015 | f72e | 0014 | 33f1 | 0015 | f736 | 0014 | 3435 | 0000 | 0007 | 0014 | 34b9 | 0000 | 0007 | 0200 | 0ddf |
| 3407260 | 0015 | f71e | 0000 | 0007 | 0200 | 0ddf | 0015 | f726 | 0000 | 0007 | 0015 | f73d | 0000 | 0007 | 0015 | f749 | 0000 | 0007 | 0200 | 0ddf | 0000 | 0007 | 0015 | f756 |
| 3407340 | 0200 | 0ddf | 0000 | 0007 | 0015 | f75e | 0015 | f765 | 0000 | 0007 | 0015 | f771 | 0000 | 0007 | 0200 | 0ddf | 0000 | 0007 | 0015 | f77e | 0200 | 0ddf | 0000 | 0007 |
| 3407420 | 0015 | f786 | 0015 | f78d | 0000 | 0007 | 0015 | f799 | 0000 | 0007 | 0200 | 0ddf | 0000 | 0007 | 0015 | f7a6 | 0200 | 0ddf | 0000 | 0007 | 0015 | f7ae | 0015 | f7b5 |
| 3407500 | 0000 | 0007 | 0015 | f7c1 | 0000 | 0007 | 0200 | 0ddf | 0000 | 0007 | 0015 | f7ce | 0200 | 0ddf | 0000 | 0007 | 0015 | f7d6 | 0015 | f7dd | 0000 | 0007 | 0015 | f7e9 |
| 3407560 | 0000 | 0007 | 0200 | 0ddf | 0000 | 0007 | 0015 | f7f6 | 0200 | 0ddf | 0000 | 0007 | 0015 | f7fe | 0015 | f805 | 0000 | 0007 | 0015 | f811 | 0000 | 0007 | 0200 | 0ddf |
| 3407640 | 0000 | 0007 | 0015 | f81e | 0200 | 0ddf | 0000 | 0007 | 0015 | f826 | 0015 | f82d | 0000 | 0007 | 0015 | f839 | 0000 | 0007 | 0200 | 0ddf | 0000 | 0007 | 0015 | f846 |
| 3407720 | 0200 | 0ddf | 0000 | 0007 | 0015 | f84e | 0015 | f855 | 0000 | 0007 | 0015 | f861 | 0000 | 0007 | 0200 | 0ddf | 0000 | 0007 | 0015 | f86e | 0200 | 0ddf | 0000 | 0007 |
| 3410000 | 0015 | f876 | 0015 | f87d | 0000 | 0007 | 0015 | f889 | 0000 | 0007 | 0600 | 32df | 0000 | 0553 | 0014 | 832c | 0014 | 8330 | 0013 | 959d | 0014 | 3359 | 0014 | 833c |
| 3410060 | 0300 | 2a87 | 0013 | 95b4 | 0015 | f8a5 | 0013 | 95bc | 0200 | 0df7 | 0015 | f8b4 | 0015 | f8c1 | 0200 | 0ad7 | 0015 | f8b8 | 0015 | f8d1 | 0300 | 2a87 | 0013 | 956c |
| 3410140 | 0014 | 8325 | 0013 | 9574 | 0200 | 0df7 | 0000 | 3387 | 0015 | f8e9 | 0200 | 0ad7 | 0015 | f8bc | 0015 | f8f9 | 0000 | 22cf | 0600 | 32df | 0000 | 055b | 0014 | 8350 |
| 3410220 | 0014 | 8354 | 0013 | 950d | 0014 | 33dd | 0014 | 8360 | 0300 | 2a87 | 0013 | 9524 | 0015 | f915 | 0013 | 952c | 0200 | 0df7 | 0015 | f924 | 0015 | f931 | 0200 | 0ad7 |
| 3410300 | 0015 | f928 | 0015 | f941 | 0300 | 2a87 | 0013 | 94dc | 0014 | 8349 | 0013 | 94e4 | 0200 | 0df7 | 0000 | 3387 | 0015 | f959 | 0200 | 0ad7 | 0015 | f92c | 0015 | f969 |
| 3410360 | 0000 | 22cf | 0200 | 0ddf | 0000 | 0007 | 0015 | f682 | 0200 | 0ddf | 0000 | 0007 | 0015 | f65a | 0200 | 0ddf | 0000 | 0007 | 0015 | f632 | 0200 | 0ddf | 0000 | 0007 |
| 3410440 | 0015 | f60a | 0200 | 0ddf | 0000 | 0007 | 0015 | f5e2 | 0200 | 0ddf | 0000 | 0007 | 0015 | f5ba | 0200 | 0ddf | 0000 | 0007 | 0015 | f592 | 0200 | 0ddf | 0000 | 0007 |
| 3410520 | 0015 | f56a | 0200 | 0ddf | 0015 | f522 | 0000 | 0007 | 0014 | 3475 | 0015 | fa02 | 0014 | 34f9 | 0015 | fa0a | 0014 | 353d | 0000 | 0007 | 0014 | 35c1 | 0000 | 0007 |
| 3410600 | 0200 | 0ddf | 0015 | f9f2 | 0000 | 0007 | 0200 | 0ddf | 0015 | f9fa | 0000 | 0007 | 0015 | fa11 | 0000 | 0007 | 0015 | fa1d | 0000 | 0007 | 0200 | 0ddf | 0000 | 0007 |
| 3410660 | 0015 | fa2a | 0200 | 0ddf | 0000 | 0007 | 0015 | fa32 | 0015 | fa39 | 0000 | 0007 | 0015 | fa45 | 0000 | 0007 | 0200 | 0ddf | 0000 | 0007 | 0015 | fa52 | 0200 | 0ddf |

```
3410740 0000 0007 0015 fa5a 0015 fa61 0000 0007 0015 fa6d 0000 0007 0200 0ddf 0000 0007 0015 fa7a 0200 0ddf 0000 0007 0015 fa82
3411020 0015 fa89 0000 0007 0015 fa95 0000 0007 0200 0ddf 0000 0007 0015 faa2 0200 0ddf 0000 0007 0015 faaa 0015 fab1 0000 0007
3411100 0015 fabd 0000 0007 0200 0ddf 0000 0007 0015 faca 0200 0ddf 0000 0007 0015 fad2 0015 fad9 0000 0007 0015 fae5 0000 0007
3411160 0200 0ddf 0000 0007 0015 faf2 0200 0ddf 0000 0007 0015 fafa 0015 fb01 0000 0007 0015 fb0d 0000 0007 0200 0ddf 0000 0007
3411240 0015 fb1a 0200 0ddf 0000 0007 0015 fb22 0015 fb29 0000 0007 0015 fb35 0000 0007 0200 0ddf 0000 0007 0015 fb42 0200 0ddf
3411320 0000 0007 0015 fb4a 0015 fb51 0000 0007 0015 fb5d 0000 0007 0600 32df 0000 0563 0014 937c 0014 8380 0013 947d 0014 3461
3411400 0014 838c 0300 2a87 0013 9494 0015 fb79 0013 949c 0200 0df7 0015 fb88 0015 fb95 0200 0ad7 0015 fb8c 0015 fba5 0300 2a87
3411460 0013 944c 0014 8375 0013 9454 0200 0df7 0000 3387 0015 fbbd 0200 0ad7 0015 fb90 0015 fbcd 0000 22cf 0600 32df 0000 056b
3411540 0014 83a8 0014 83ac 0013 93ed 0014 34e5 0014 83b8 0300 2a87 0013 9404 0015 fbe9 0013 940c 0200 0df7 0015 fbf8 0015 fc05
3411620 0200 0ad7 0015 fbfc 0015 fc15 0300 2a87 0013 93bc 0014 83a1 0013 93c4 0200 0df7 0000 3387 0015 fc2d 0200 0ad7 0015 fc00
3411700 0015 fc3d 0000 22cf 0200 0ddf 0000 0007 0015 d7c6 0200 0ddf 0000 0007 0015 d79e 0200 0ddf 0000 0007 0015 d776 0200 0ddf
3411760 0000 0007 0015 d74e 0200 0ddf 0000 0007 0015 d726 0200 0ddf 0000 0007 0015 d6fe 0200 0ddf 0000 0007 0015 d6d6 0200 0ddf
3412040 0000 0007 0015 d6ae 0200 0ddf 0015 d586 0000 0007 0014 357d 0015 fcce 0014 3601 0015 fcd6 0014 3645 0015 fcde 0014 3685
3412120 0015 fce6 0014 36c9 0015 fcee 0014 3709 0015 fcf6 0014 374d 0015 fcfe 0014 378d 0015 fd06 000b 3eb0 0300 75a7 0000 758f
3412200 0000 000c 0015 ff28 0015 ff28 0001 0079 0000 0000 000b 5a8c 0300 75af 0000 758f 0000 000c 0015 ffb8 0015 ffb8 0001 0079
3412260 0000 0000 000b 4454 0200 75b7 0000 758f 0000 0008 0016 0048 0016 0048 0001 0079 0000 0000 0015 a7a8 0800 70af 0000 758f
3412340 0000 0020 0016 00c0 0016 00c0 0001 0079 0000 0000 0015 a868 0400 70df 0000 758f 0000 0010 0016 442c 0016 442c 0001 0079
3412420 0000 0000 0015 fec8 0000 0084 b288 b66c 0000 0fcc 7fff ffff 0016 2344 0200 0db5 0100 15ad 0100 33fd 0000 000b 0000 315f
3412500 0015 fe00 0000 002c b288 b66c 0000 0fcc 7fff ffff 0015 fdac 0200 0db5 0100 15ad 0100 33fd 0000 000b 0000 315f 0015 fec8
3412560 0000 002c b288 b66c 0000 0fcc 7fff ffff 0015 fdd8 0200 0db5 0100 15ad 0100 33fd 0000 000b 0000 315f 0000 0034 0014 3a14
3412640 b27c b66c 0000 0fcd 7fff ffff 0015 fe64 0200 0db5 0400 24ad 0000 1ff7 0000 0013 0000 758f 0000 75bf 0000 315f 0000 0034
3412720 0015 fe30 b27c b66c 0000 0fce 7fff ffff 0015 fe98 0200 0db5 0400 24ad 0000 4c0f 0000 0013 0000 758f 0000 4b77 0000 315f
3413000 0000 0034 0015 fe64 b27c b66c 0000 0fcf 7fff ffff 0016 29d0 0200 0db5 0400 24ad 0000 4c2f 0000 0013 0000 758f 0000 4b77
3413060 0000 315f 0015 ff84 0000 0064 b27c b66c 0000 0fd0 0000 0fda 0015 ff88 0200 0db5 0500 1cdd 0000 75a7 0000 001b 0000 758f
3413140 00af e8a3 0000 03cb 0000 315f 0015 ff84 0000 002c b4f0 b4e4 0000 0fcf 7fff ffff 0008 b0dd 0000 0000 0000 0000 0016 02c8
3413220 0002 438a 0015 bcf0 2c78 0058 0002 438a 45dc 46ec 4740 3380 001c 42ac 0000 760f 0016 1dcc 0020 aa88 001c aa88 001c 9d88
3413300 ac08 aa6c abe0 0000 43b4 0000 9e0c a858 9de0 ac08 3348 247c 000e 7890 0018 aa50 aa34 9de0 ac08 37dc 242c 0000 0015 fd54
3413360 0016 0014 0000 0038 b27c b66c 0000 0fd2 0000 0fdb 0016 0018 0200 0db5 0500 1cdd 0000 75af 0000 001b 0000 758f 00af e9a3
3413440 0000 03cb 0000 315f 2c78 0058 0002 438a 45dc 46ec 4740 3380 001c 42ac 0000 760f 0016 1dcc 0020 aa88 001c aa88 001c 9d88
3413520 ac08 aa6c abe0 0000 43b4 0000 9e0c a858 9de0 ac08 3348 247c 000e 7980 0018 aa50 aa34 9de0 ac08 37dc 242c 0000 0015 fd54
3413600 0016 008c 0000 0038 b27c b66c 0000 0fd3 0000 0fdc 0016 0090 0200 0db5 0500 1cdd 0000 75b7 0000 0013 0000 758f 00af eaa3
3413660 0000 03cb 0000 315f 2c78 0040 0002 438a 45c4 46d8 9314 9974 aa34 9d04 ac08 aa34 a858 9db0 ac08 a858 abe0 0000 3f00 0000
3413740 a424 000e aa34 9d04 aaf0 0001 af34 723c aa34 9d04 af34 723c 0016 02c4 0000 0038 b27c b66c 0000 0fd4 0000 0fdd 0016 02c8
3414020 0200 0db5 0500 1cdd 0000 70af 0000 0043 0000 758f 00af eba3 0000 03cb 0000 315f 2c78 0200 0002 438a 2520 4728 0060 4790
3414100 0050 47f0 0044 4880 0018 0038 4880 001c 002c 4880 0020 0020 4810 0024 4568 6af0 001c 5370 4550 6aa0 6bf4 4568 6a50 6bb4
3414160 4550 6a00 6bf4 4568 5fa0 6bb4 4550 6af0 0028 6bf4 4568 6af0 0024 6bb4 4550 5fa0 6bf4 4568 6af0 0034 6bb4 4550 6af0 0030
3414240 6bf4 4568 5fa0 6bb4 4550 6af0 0040 6bf4 4568 6af0 003c 6bb4 4550 5fa0 6bf4 4568 6af0 004c 6bb4 4550 6af0 0048 6bf4 4568
3414320 5fa0 6bb4 4550 6af0 005c 6bf4 4568 6af0 0058 6bb4 4550 6af0 0054 6bf4 4568 5fa0 6bb4 4550 6af0 006c 6bf4 4568 6af0 0068
3414400 6bb4 4550 6af0 0064 6bf4 247c 0008 b39c 0070 4550 6e58 006c 5370 4538 6e58 0068 6bb4 4550 6e58 0064 6b74 3c9c 0000 0060
3414460 0008 b39c 0060 4550 6e58 005c 5370 4538 6e58 0058 6bb4 4550 6e58 0054 6b74 3c9c 0000 0050 0008 b39c 0050 4538 6e58 004c
3414540 5370 4550 4b8c 0000 0000 0103 6b74 4568 6e58 004c 5370 4538 6e58 0043 6bf4 ad94 aab4 0000 a1d0 0018 4550 6e58 004c 5370
3414620 3af4 0044 000d d2dc 0050 2c88 001e 4538 6e58 004c 5370 4550 6e58 0048 6b74 3c9c 0000 0044 0008 d2dc 0044 4538 6e58 0040
3414700 5370 4550 6e58 003c 6b74 3c9c 0000 0038 0008 d2dc 0038 4538 6e58 0034 5370 4550 6e58 0030 6b74 3c9c 0000 002c 0008 d2dc
3414760 002c 4538 6e58 0028 5370 4550 6e58 0024 6b74 3c9c 0000 0020 0008 d2dc 0020 4538 6e58 001c 5370 4550 6e08 6b74 4538 6dc4
3415040 6bb4 4550 6d80 6b74 2420 0000 0008 d2dc 0016 2340 0000 1aec b130 b66c 0000 0fd5 0000 0fde 0015 ff05 0200 0db5 0500 1cdd
3415120 0000 70df 0000 0023 0000 758f 00af eca3 0000 03cb 0000 315f 0016 2340 0000 1ab4 292e 0a63 6f6e 7374 616e 7428 312f 6c6e
3415200 2832 292c 0931 2e34 3432 3639 3530 3430 3839 3839 3633 3430 3733 3629 2e0a 636f 6e73 7461 6e74 2831 2f6c 6e28 3130 292c
3415260 0930 2e34 3334 3239 3434 3831 3930 3332 3531 3832 3736 3529 2e0a 636f 6e73 7461 6e74 286c 6e28 6c6e 2832 2929 2c20 2020
3415340 202d 302e 3336 3635 3132 3932 3035 3831 3636 3433 3237 3031 292e 0a0a 636f 6e73 7461 6e74 2870 692c 0909 332e 3134 3135
3415420 3932 3635 3335 3939 3739 3332 3338 3436 292e 0a63 6f6e 7374 616e 7428 7069 2f31 3830 2c09 302e 3031 3734 3533 3239 3235
3415500 3139 3934 3332 3935 3737 292e 0a63 6f6e 7374 616e 7428 312f 7069 2c09 0930 2e33 3138 3330 3938 3836 3198 3337 3930 3637
3415560 3135 3429 2e0a 636f 6e73 7461 6e74 2870 695e 322c 0909 392e 3836 3936 3034 3430 3130 3839 3335 3836 3138 3833 292e 0a63
3415640 6f6e 7374 616e 7428 7371 7274 2870 6929 2c09 312e 3737 3234 3533 3835 3039 3035 3531 3630 3237 3330 292e 0a63 6f6e 7374
3415720 616e 7428 6c6e 2970 6929 2c09 312e 3134 3437 3239 3838 3538 3439 3430 3031 3734 3134 292e 0a0a 636f 6e73 7461 6e74 2867
3416000 616d 6d61 2831 2f32 292c 0931 2e37 3732 3435 3338 3530 3930 3535 3136 3032 3733 3029 2e0a 636f 6e73 7461 6e74 2867 616d
```

```
3416060  6d61 2831 2f33 292c 0932 2e36 3738 3933 3835 3334 3730 3737 3437 3633 3336 3629 2e0a 636f 6e73 7461 6e74 2867 616d 6d61
3416140  2832 2f33 292c 0931 2e33 3534 3131 3739 3339 3432 3634 3030 3431 3639 3529 2e0a 0a63 6f6e 7374 616e 7428 652c 0909 322e
3416220  3731 3832 3831 3832 3834 3539 3934 3532 3335 3336 292e 0a63 6f6e 7374 616e 7428 312f 652c 0909 302e 3336 3738 3739 3434
3416300  3131 3731 3434 3233 3231 3630 292e 0a63 6f6e 7374 616e 7428 655e 322c 0909 372e 3338 3930 3536 3039 3839 3330 3635 3032
3416360  3237 3233 292e 0a63 6f6e 7374 616e 7428 655e 2870 692f 3429 2c09 322e 3139 3332 3830 3035 3037 3338 3031 3534 3536 3536
3416440  292e 0a0a 636f 6e73 7461 6e74 2867 616d 6d61 2c09 0930 2e35 3737 3231 3536 3634 3930 3135 3332 3836 3036 3129 2e0a 636f
3416520  6e73 7461 6e74 2865 5e67 616d 6161 2c09 312e 3738 3130 3732 3431 3739 3930 3139 3739 3835 3234 292e 0a0a 636f 6e73 7461
3416600  6e74 2870 6869 2c09 0931 2e36 3138 3033 3339 3838 3734 3938 3934 3834 3832 3029 2e0a 636f 6e73 7461 6e74 286c 6e28 7068
3416660  6929 2c09 302e 3438 3132 3131 3832 3530 3539 3630 3334 3437 3530 292e 0a63 6f6e 7374 616e 7428 312f 6c6e 2870 6869 292c
3416740  0932 2e30 3738 3038 3639 3231 3233 3530 3237 3533 3736 3029 2e0a 0a63 6f6e 7374 616e 7428 7369 6e28 3129 2c09 302e 3834
3417020  3134 3730 3938 3438 3037 3839 3635 3036 3635 292e 0a63 6f6e 7374 616e 7428 636f 7328 3129 2c09 302e 3534 3033 3032 3330
3417100  3538 3638 3133 3937 3137 3430 292e 0a0a 636f 6e73 7461 6e74 287a 6574 6128 3329 2c09 312e 3230 3230 3536 3930 3331 3539
3417160  3539 3432 3835 3430 292e 0a0a 0016 06f5 0000 0007 0016 0701 0000 0007 0200 0ddf 0000 0007 0016 070e 0200 0ddf 0000 0007
3417240  0016 0716 0016 071d 0000 0007 0016 0729 0000 0007 0200 0ddf 0000 0007 0016 0736 0200 0ddf 0000 0007 0016 073e 0016 0745
3417320  0000 0007 0016 0751 0000 0007 0200 0ddf 0000 0007 0016 075e 0200 0ddf 0000 0007 0016 0766 0016 076d 0000 0007 0016 0779
3417400  0000 0007 0200 0ddf 0000 0007 0016 0786 0200 0ddf 0000 0007 0016 078e 0016 0795 0000 0007 0016 07a1 0000 0007 0200 0ddf
3417460  0000 0007 0016 07ae 0200 0ddf 0000 0007 0016 07b6 0016 07bd 0000 0007 0016 07c9 0000 0007 0200 0ddf 0000 0007 0016 07d6
3417540  0200 0ddf 0000 0007 0016 07de 0016 07e5 0000 0007 0016 07f1 0000 0007 0200 0ddf 0000 0007 0016 07fe 0200 0ddf 0000 0007
3417620  0016 0806 0016 080d 0000 0007 0016 0819 0000 0007 0200 0ddf 0000 0007 0016 0826 0200 0ddf 0000 0007 0016 082e 0016 0835
3417700  0000 0007 0016 0841 0000 0007 0600 321f 0000 0583 0014 842c 0014 8430 0013 923d 0014 3671 0014 843c 0300 2a87 0013 9254
3417760  0016 085d 0013 925c 0200 0df7 0016 086c 0016 0879 0200 0ad7 0016 0870 0016 0989 0300 2a87 0013 920c 0014 8425 0013 9214
3420040  0200 0df7 0000 3387 0016 08a1 0200 0ad7 0016 0874 0016 08b1 0000 22cf 0600 32df 0000 058b 0014 8458 0014 845c 0013 91ad
3420120  0014 36f5 0014 8468 0300 2a87 0013 91c4 0016 08cd 0013 91cc 0200 0df7 0016 08dc 0016 08e9 0200 0ad7 0016 08e0 0016 08f9
3420200  0300 2a87 0013 917c 0014 8451 0013 9184 0200 0df7 0000 3387 0016 0911 0200 0ad7 0016 08e4 0016 0921 0000 22cf 0200 0ddf
3420260  0000 0007 0016 0152 0200 0ddf 0000 0007 0016 012a 0200 0ddf 0000 0007 0016 0102 0200 0ddf 0000 0007 0016 00da 0200 0ddf
3420340  0000 0007 0016 00b2 0200 0ddf 0000 0007 0016 008a 0200 0ddf 0000 0007 0016 0062 0200 0ddf 0000 0007 0016 003a 0200 0ddf
3420420  0015 ffd2 0000 0007 0014 378d 0016 09b2 0014 3811 0016 09ba 0014 3855 0016 09ca 0014 3895 0016 09d2 0014 38d9 0000 0007
3420500  0014 3919 0016 09da 0014 3951 0016 09e2 0014 39e1 0000 0007 0200 0ddf 0016 09aa 0000 0007 0200 0ddf 0016 09c2 0000 0007
3420560  0016 09e9 0000 0007 0016 09f5 0000 0007 0200 0ddf 0000 0007 0016 0a02 0200 0ddf 0000 0007 0016 0a0a 0016 0a11 0000 0007
3420640  0016 0a1d 0000 0007 0200 0ddf 0000 0007 0016 0a2a 0200 0ddf 0000 0007 0016 0a32 0016 0a39 0000 0007 0016 0a45 0000 0007
3420720  0200 0ddf 0000 0007 0016 0a52 0200 0ddf 0000 0007 0016 0a5a 0016 0a61 0000 0007 0016 0a6d 0000 0007 0200 0ddf 0000 0007
3421000  0016 0a7a 0200 0ddf 0000 0007 0016 0a82 0016 0a89 0000 0007 0016 0a95 0000 0007 0200 0ddf 0000 0007 0016 0aa2 0200 0ddf
3421060  0000 0007 0016 0aaa 0016 0ab1 0000 0007 0016 0abd 0000 0007 0200 0ddf 0000 0007 0016 0aca 0200 0ddf 0000 0007 0016 0ad2
3421140  0016 0ad9 0000 0007 0016 0ae5 0000 0007 0200 0ddf 0000 0007 0016 0af2 0200 0ddf 0000 0007 0016 0afa 0016 0b01 0000 0007
3421220  0016 0b0d 0000 0007 0200 0ddf 0000 0007 0016 0b1a 0200 0ddf 0000 0007 0016 0b22 0016 0b29 0000 0007 0016 0b35 0000 0007
3421300  0200 0ddf 0000 0007 0016 0b1a 0200 0ddf 0000 0007 0016 0af2 0200 0ddf 0000 0007 0016 0aca 0200 0ddf 0000 0007 0016 0aa2
3421360  0200 0ddf 0000 0007 0016 0a7a 0200 0ddf 0000 0007 0016 0a52 0200 0ddf 0000 0007 0016 0a2a 0200 0ddf 0000 0007 0016 0a02
3421440  0200 0ddf 0016 09aa 0000 0007 0014 378d 0016 0bce 0014 3811 0016 0bd6 0014 3855 0000 0007 0014 38d9 0000 0007 0200 0ddf
3421520  0016 0bbe 0000 0007 0200 0ddf 0016 0bc6 0000 0007 0016 0bdd 0000 0007 0016 0be9 0000 0007 0200 0ddf 0000 0007 0016 0bf6
3421600  0200 0ddf 0000 0007 0016 0bfe 0016 0c05 0000 0007 0016 0c11 0000 0007 0200 0ddf 0000 0007 0016 0c1e 0200 0ddf 0000 0007
3421660  0016 0c26 0016 0c2d 0000 0007 0016 0c39 0000 0007 0200 0ddf 0000 0007 0016 0c46 0200 0ddf 0000 0007 0016 0c4e 0016 0c55
3421740  0000 0007 0016 0c61 0000 0007 0200 0ddf 0000 0007 0016 0c6e 0200 0ddf 0000 0007 0016 0c76 0016 0c7d 0000 0007 0016 0c89
3422020  0000 0007 0200 0ddf 0000 0007 0016 0c96 0200 0ddf 0000 0007 0016 0c9e 0016 0ca5 0000 0007 0016 0cb1 0000 0007 0200 0ddf
3422100  0000 0007 0016 0cbe 0200 0ddf 0000 0007 0016 0cc6 0016 0ccd 0000 0007 0016 0cd9 0000 0007 0200 0ddf 0000 0007 0016 0ce6
3422160  0200 0ddf 0000 0007 0016 0cee 0016 0cf5 0000 0007 0016 0d01 0000 0007 0200 0ddf 0000 0007 0016 0d0e 0200 0ddf 0000 0007
3422240  0016 0d16 0016 0d1d 0000 0007 0016 0d29 0000 0007 0600 32df 0000 0593 0014 8484 0014 8488 0013 911d 0014 3779 0014 8494
3422320  0300 2a87 0013 9134 0016 0d45 0013 913c 0200 0df7 0016 0d54 0016 0d61 0200 0ad7 0016 0d58 0016 0d71 0300 2a87 0013 90ec
3422400  0014 847d 0013 90f4 0200 0df7 0000 3387 0016 0d89 0200 0ad7 0016 0d5c 0016 0d99 0000 22cf 0600 32df 0000 059b 0014 84b0
3422460  0014 84b4 0013 908d 0014 37fd 0014 84c0 0300 2a87 0013 90a4 0016 0db5 0013 90ac 0200 0df7 0016 0dc4 0016 0dd1 0200 0ad7
3422540  0016 0dc8 0016 0de1 0300 2a87 0013 905c 0014 84a9 0013 9064 0200 0df7 0000 3387 0016 0df9 0200 0ad7 0016 0dcc 0016 0e09
3422620  0000 22cf 0200 0ddf 0000 0007 0016 0b22 0200 0ddf 0000 0007 0016 0afa 0200 0ddf 0000 0007 0016 0ad2 0200 0ddf 0000 0007
3422700  0016 0aaa 0200 0ddf 0000 0007 0016 0a82 0200 0ddf 0000 0007 0016 0a5a 0200 0ddf 0000 0007 0016 0a32 0200 0ddf 0000 0007
3422760  0016 0a0a 0200 0ddf 0016 09c2 0000 0007 0014 3895 0016 0ea2 0014 3919 0016 0eaa 0014 395d 0000 0007 0014 39e1 0000 0007
3423040  0200 0ddf 0016 0e92 0000 0007 0200 0ddf 0016 0e9a 0000 0007 0016 0eb1 0000 0007 0016 0ebd 0000 0007 0200 0ddf 0000 0007
3423120  0016 0eca 0200 0ddf 0000 0007 0016 0ed2 0016 0ed9 0000 0007 0016 0ee5 0000 0007 0200 0ddf 0000 0007 0016 0ef2 0200 0ddf
```

```
3423200  0000 0007 0016 0efa 0016 0f01 0000 0007 0016 0f0d 0000 0007 0200 0ddf 0000 0007 0016 0f1a 0200 0ddf 0000 0007 0016 0f22
3423260  0016 0f29 0000 0007 0016 0f35 0000 0007 0200 0ddf 0000 0007 0016 0f42 0200 0ddf 0000 0007 0016 0f4a 0016 0f51 0000 0007
3423340  0016 0f5d 0000 0007 0200 0ddf 0000 0007 0016 0f6a 0200 0ddf 0000 0007 0016 0f72 0016 0f79 0000 0007 0016 0f85 0000 0007
3423420  0200 0ddf 0000 0007 0016 0f92 0200 0ddf 0000 0007 0016 0f9a 0016 0fa1 0000 0007 0016 0fad 0000 0007 0200 0ddf 0000 0007
3423500  0016 0fba 0200 0ddf 0000 0007 0016 0fc2 0016 0fc9 0000 0007 0016 0fd5 0000 0007 0200 0ddf 0000 0007 0016 0fe2 0200 0ddf
3423560  0000 0007 0016 0fea 0016 0ff1 0000 0007 0016 0ff1 0000 0007 0600 32df 0000 05a3 0014 84dc 0014 84e0 0013 8ffd 0014 3881
3423640  0014 84ec 0300 2a87 0013 9014 0016 1019 0013 901c 0200 0df7 0016 1028 0016 1035 0200 0ad7 0016 102c 0016 1045 0300 2a87
3423720  0013 8fcc 0014 84d5 0013 8fd4 0200 0df7 0000 3387 0016 105d 0200 0ad7 0016 1030 0016 106d 0000 22cf 0600 32df 0000 05ab
3424000  0014 8508 0014 850c 0013 8f6d 0014 3905 0014 8518 0300 2a87 0013 8f84 0016 1089 0013 8f8c 0200 0df7 0016 1098 0016 10a5
3424060  0200 0ad7 0016 109c 0016 10b5 0300 2a87 0013 8f3c 0014 8501 0013 8f44 0200 0df7 0000 3387 0016 10cd 0200 0ad7 0016 10a0
3424140  0016 10dd 0000 22cf 0200 0ddf 0000 0007 0015 fefe 0200 0ddf 0000 0007 0015 fed6 0200 0ddf 0000 0007 0015 feae 0200 0ddf
3424220  0000 0007 0015 fe86 0200 0ddf 0000 0007 0015 fe5e 0200 0ddf 0000 0007 0015 fe36 0200 0ddf 0000 0007 0015 fe0e 0200 0ddf
3424300  0000 0007 0015 fde6 0200 0ddf 0015 fd3e 0000 0007 0014 399d 0016 116e 0014 3a21 0016 1176 0014 3a65 0016 117e 0014 3aa5
3424360  0016 1186 0014 3ae9 0016 118e 0014 3b29 0016 1196 0014 3b6d 0016 11a6 0014 3bad 0016 11ae 0014 3bf1 0000 0007 0014 3c31
3424440  0016 11b6 0014 3c75 0016 11be 0014 3cb5 0016 11c6 0014 3cf9 0016 11ce 0014 3d39 0016 11d6 0014 3d7d 0016 11de 0014 3e01
3424520  0000 0007 0200 0ddf 0016 1166 0000 0007 0200 0ddf 0016 119e 0000 0007 0016 11e5 0000 0007 0016 11f1 0000 0007 0200 0ddf
3424600  0000 0007 0016 11fe 0200 0ddf 0000 0007 0016 1206 0016 120d 0000 0007 0016 1219 0000 0007 0200 0ddf 0000 0007 0016 1226
3424660  0200 0ddf 0000 0007 0016 122e 0016 1235 0000 0007 0016 1241 0000 0007 0200 0ddf 0000 0007 0016 124e 0200 0ddf 0000 0007
3424740  0016 1256 0016 125d 0000 0007 0016 1269 0000 0007 0200 0ddf 0000 0007 0016 1276 0200 0ddf 0000 0007 0016 127e 0016 1285
3425020  0000 0007 0016 1291 0000 0007 0200 0ddf 0000 0007 0016 129e 0200 0ddf 0000 0007 0016 12a6 0016 12ad 0000 0007 0016 12b9
3425100  0000 0007 0200 0ddf 0000 0007 0016 12c6 0200 0ddf 0000 0007 0016 12ce 0016 12d5 0000 0007 0016 12e1 0000 0007 0200 0ddf
3425160  0000 0007 0016 12ee 0200 0ddf 0000 0007 0016 12f6 0016 12fd 0000 0007 0016 1309 0000 0007 0200 0ddf 0000 0007 0016 1316
3425240  0200 0ddf 0000 0007 0016 131e 0016 1325 0000 0007 0016 1331 0000 0007 0200 0ddf 0000 0007 0016 1316 0200 0ddf 0000 0007
3425320  0016 12ee 0200 0ddf 0000 0007 0016 12c6 0200 0ddf 0000 0007 0016 129e 0200 0ddf 0000 0007 0016 1276 0200 0ddf 0000 0007
3425400  0016 124e 0200 0ddf 0000 0007 0016 1226 0200 0ddf 0000 0007 0016 11fe 0200 0ddf 0016 1166 0000 0007 0014 399d 0016 13c2
3425460  0014 3a21 0016 13ca 0014 3a65 0016 13da 0014 3aa5 0016 13e2 0014 3ae9 0000 0007 0014 3b29 0016 13ea 0014 3b6d 0016 13f2
3425540  0014 3bf1 0000 0007 0200 0ddf 0016 13ba 0000 0007 0200 0ddf 0016 13d2 0000 0007 0016 13f9 0000 0007 0016 1405 0000 0007
3425620  0200 0ddf 0000 0007 0016 1412 0200 0ddf 0000 0007 0016 141a 0016 1421 0000 0007 0016 142d 0000 0007 0200 0ddf 0000 0007
3425700  0016 143a 0200 0ddf 0000 0007 0016 1442 0016 1449 0000 0007 0016 1455 0000 0007 0200 0ddf 0000 0007 0016 1462 0200 0ddf
3425760  0000 0007 0016 146a 0016 1471 0000 0007 0016 147d 0000 0007 0200 0ddf 0000 0007 0016 148a 0200 0ddf 0000 0007 0016 1492
3426040  0016 1499 0000 0007 0016 14a5 0000 0007 0200 0ddf 0000 0007 0016 14b2 0200 0ddf 0000 0007 0016 14ba 0016 14c1 0000 0007
3426120  0016 14cd 0000 0007 0200 0ddf 0000 0007 0016 14da 0200 0ddf 0000 0007 0016 14e2 0016 14e9 0000 0007 0016 14f5 0000 0007
3426200  0200 0ddf 0000 0007 0016 1502 0200 0ddf 0000 0007 0016 150a 0016 1511 0000 0007 0016 151d 0000 0007 0200 0ddf 0000 0007
3426260  0016 152a 0200 0ddf 0000 0007 0016 1532 0016 1539 0000 0007 0016 1545 0000 0007 0200 0ddf 0000 0007 0016 152a 0200 0ddf
3426340  0000 0007 0016 1502 0200 0ddf 0000 0007 0016 14da 0200 0ddf 0000 0007 0016 14b2 0200 0ddf 0000 0007 0016 148a 0200 0ddf
3426420  0000 0007 0016 1462 0200 0ddf 0000 0007 0016 143a 0200 0ddf 0000 0007 0016 1412 0200 0ddf 0016 13ba 0000 0007 0014 399d
3426500  0016 15de 0014 3a21 0016 15e6 0014 3a65 0000 0007 0014 3ae9 0000 0007 0200 0ddf 0016 15ce 0000 0007 0200 0ddf 0016 15d6
3426560  0000 0007 0016 15ed 0000 0007 0016 15f9 0000 0007 0200 0ddf 0000 0007 0016 1606 0200 0ddf 0000 0007 0016 160e 0016 1615
3426640  0000 0007 0016 1621 0000 0007 0200 0ddf 0000 0007 0016 162e 0200 0ddf 0000 0007 0016 1636 0016 163d 0000 0007 0016 1649
3426720  0000 0007 0200 0ddf 0000 0007 0016 1656 0200 0ddf 0000 0007 0016 165e 0016 1665 0000 0007 0016 1671 0000 0007 0200 0ddf
3427000  0000 0007 0016 167e 0200 0ddf 0000 0007 0016 1686 0016 168d 0000 0007 0016 1699 0000 0007 0200 0ddf 0000 0007 0016 16a6
3427060  0200 0ddf 0000 0007 0016 16ae 0016 16b5 0000 0007 0016 16c1 0000 0007 0200 0ddf 0000 0007 0016 16ce 0200 0ddf 0000 0007
3427140  0016 16d6 0016 16dd 0000 0007 0016 16e9 0000 0007 0200 0ddf 0000 0007 0016 16f6 0200 0ddf 0000 0007 0016 16fe 0016 1705
3427220  0000 0007 0016 1711 0000 0007 0200 0ddf 0000 0007 0016 171e 0200 0ddf 0000 0007 0016 1726 0016 172d 0000 0007 0016 1739
3427300  0000 0007 0600 32df 0000 05b3 0014 8534 0014 8538 0013 8edd 0014 3989 0014 8544 0300 2a87 0013 8ef4 0016 1755 0013 8efc
3427360  0200 0df7 0016 1764 0016 1771 0200 0ad7 0016 1768 0016 1781 0300 2a87 0013 8eac 0014 852d 0013 8eb4 0200 0df7 0000 3387
3427440  0016 1799 0200 0ad7 0016 176c 0016 17a9 0000 22cf 0600 32df 0000 05bb 0014 8560 0014 8564 0013 8e4d 0014 3a0d 0014 8570
3427520  0300 2a87 0013 8e64 0016 17c5 0013 8e6c 0200 0df7 0016 17d4 0016 17e1 0200 0ad7 0016 17d8 0016 17f1 0300 2a87 0013 8e1c
3427600  0014 8559 0013 8e24 0200 0df7 0000 3387 0016 1809 0200 0ad7 0016 17dc 0016 1819 0000 22cf 0200 0ddf 0000 0007 0016 1532
3427660  0200 0ddf 0000 0007 0016 150a 0200 0ddf 0000 0007 0016 14e2 0200 0ddf 0000 0007 0016 14ba 0200 0ddf 0000 0007 0016 1492
3427740  0200 0ddf 0000 0007 0016 146a 0200 0ddf 0000 0007 0016 1442 0200 0ddf 0000 0007 0016 141a 0200 0ddf 0016 13d2 0000 0007
3430020  0014 3aa5 0016 18b2 0014 3b29 0016 18ba 0014 3b6d 0000 0007 0014 3bf1 0000 0007 0200 0ddf 0016 18a2 0000 0007 0200 0ddf
3430100  0016 18aa 0000 0007 0016 18c1 0000 0007 0016 18cd 0000 0007 0200 0ddf 0000 0007 0016 18da 0200 0ddf 0000 0007 0016 18e2
3430160  0016 18e9 0000 0007 0016 18f5 0000 0007 0200 0ddf 0000 0007 0016 1902 0200 0ddf 0000 0007 0016 190a 0016 1911 0000 0007
3430240  0016 191d 0000 0007 0200 0ddf 0000 0007 0016 192a 0200 0ddf 0000 0007 0016 1932 0016 1939 0000 0007 0016 1945 0000 0007
```

```
3430320 0200 0ddf 0000 0007 0016 1952 0200 0ddf 0000 0007 0016 195a 0016 1961 0000 0007 0016 196d 0000 0007 0200 0ddf 0000 0007
3430400 0016 197a 0200 0ddf 0000 0007 0016 1982 0016 1989 0000 0007 0016 1995 0000 0007 0200 0ddf 0000 0007 0016 19a2 0200 0ddf
3430460 0000 0007 0016 19aa 0016 19b1 0000 0007 0016 19b4 0000 0007 0200 0ddf 0000 0007 0016 19ca 0200 0ddf 0000 0007 0016 19d2
3430540 0016 19d9 0000 0007 0016 19e5 0000 0007 0200 0ddf 0000 0007 0016 19f2 0200 0ddf 0000 0007 0016 19fa 0016 1a01 0000 0007
3430620 0016 1a0d 0000 0007 0600 32df 0000 05c3 0014 858c 0014 8590 0013 8dbd 0014 3a91 0014 859c 0300 2a87 0013 8d84 0016 1a29
3430700 0013 8ddc 0200 0df7 0016 1a38 0016 1a45 0200 0ad7 0016 1a3c 0016 1a55 0300 2a87 0013 8d8c 0014 8585 0013 8d94 0200 0df7
3430760 0000 3387 0016 1a6d 0200 0ad7 0016 1a40 0016 1a7d 0000 22cf 0600 32df 0000 05cb 0014 85b8 0014 85bc 0013 8d2d 0014 3b15
3431040 0014 85c8 0300 2a87 0013 8d44 0016 1a99 0013 8d4c 0200 0df7 0016 1aa8 0016 1ab5 0200 0ad7 0016 1aac 0016 1ac5 0300 2a87
3431120 0013 8cfc 0014 85b1 0013 8d04 0200 0df7 0007 3397 0016 1add 0200 0ad7 0016 1ab0 0016 1aed 0000 22cf 0200 0ddf 0000 0007
3431200 0016 131e 0200 0ddf 0000 0007 0016 12f6 0200 01df 0000 0007 0016 12ce 0200 0ddf 0000 0007 0016 12a6 0200 0ddf 0000 0007
3431260 0016 127e 0200 0ddf 0000 0007 0016 1256 0200 0ddf 0000 0007 0016 122e 0200 0ddf 0000 0007 0016 1206 0200 0ddf 0016 119e
3431340 0000 0007 0014 3bad 0016 1b7e 0014 3c31 0016 1b86 0014 3c75 0016 1b96 0014 3cb5 0016 1b9e 0014 3cf9 0000 0007 0014 3d39
3431420 0016 1ba6 0014 3d7d 0016 1bae 0014 3e01 0000 0007 0200 0ddf 0016 1b76 0000 0007 0200 0ddf 0016 1b8e 0000 0007 0016 1bb5
3431500 0000 0007 0016 1bc1 0000 0007 0200 0ddf 0000 0007 0016 1bce 0200 0ddf 0000 0007 0016 1bd6 0016 1bdd 0000 0007 0016 1be9
3431560 0000 0007 0200 0ddf 0000 0007 0016 1bf6 0200 0ddf 0000 0007 0016 1bfe 0016 1c05 0000 0007 0016 1c11 0000 0007 0200 0ddf
3431640 0000 0007 0016 1c1e 0200 0ddf 0000 0007 0016 1c26 0016 1c2d 0000 0007 0016 1c39 0000 0007 0200 0ddf 0000 0007 0016 1c46
3431720 0200 0ddf 0000 0007 0016 1c4e 0016 1c55 0000 0007 0016 1c61 0000 0007 0200 0ddf 0000 0007 0016 1c6e 0200 0ddf 0000 0007
3432000 0016 1c76 0016 1c7d 0000 0007 0016 1c89 0000 0007 0200 0ddf 0000 0007 0016 1c96 0200 0ddf 0000 0007 0016 1c9e 0016 1ca5
3432060 0000 0007 0016 1cb1 0000 0007 0200 0ddf 0000 0007 0016 1cbe 0200 0ddf 0000 0007 0016 1cc6 0016 1ccd 0000 0007 0016 1cd9
3432140 0000 0007 0200 0ddf 0000 0007 0016 1ce6 0200 0ddf 0000 0007 0016 1cee 0016 1cf5 0000 0007 0016 1d01 0000 0007 0200 0ddf
3432220 0000 0007 0016 1ce6 0200 0ddf 0000 0007 0016 1cbe 0200 0ddf 0000 0007 0016 1c96 0200 0ddf 0000 0007 0016 1c6e 0200 0ddf
3432300 0000 0007 0016 1c46 0200 0ddf 0000 0007 0016 1c1e 0200 0ddf 0000 0007 0016 1bf6 0200 0ddf 0000 0007 0016 1bce 0200 0ddf
3432360 0016 1b76 0000 0007 0014 3bad 0016 1d9a 0014 3c31 0016 1da2 0014 3c75 0000 0007 0014 3cf9 0000 0007 0200 0ddf 000f cec8
3432440 0000 0000 0014 826c 0016 1dac 0014 8530 0200 1ff7 0000 75bf 0000 0008 0016 1ed8 0016 1ed8 0001 007a 0000 0000 c020 2240
3432520 2823 2938 392f 3031 2f33 3c20 6b6e 7574 685f 625f 312e 706c 0932 392e 3122 0007 0015 82cc 0100 2def 0000 75bf 0000 0004
3432600 0016 1e78 0016 1e78 0001 007a 0000 0000 0000 1ff7 b328 0007 0015 fe34 0000 0000 0000 0028 0015 82f4 b27c b66c 0000 0fc5
3432660 7fff ffff 0016 437c 0200 0db5 0100 32b5 0000 75bf 0000 315f 0000 75bf b328 1e42 0016 1e3c 0000 0000 000f c76c 0000 0000
3432740 0016 1e58 0016 1e69 2cac 1e62 0002 438a 2ca0 0007 c000 0000 0000 0001 0014 1464 0014 1464 0002 438a 0016 1e9c 0014 1470
3433020 000c 6b6e 7574 695f 625f 312e 706c 0000 0016 4344 000e 1f9c 27f0 0020 0016 1efc 5d10 0000 0100 4bb7 4b8c 0000 0000 0013
3433100 52c4 0000 9fda 827f 2cac 1ec1 0002 438a 2ca0 1ecd 0000 003c 0000 000c 0016 1eb8 0016 22fc 0002 438a 0015 6b48 28c4 0020
3433160 0016 1f2c 5d10 0000 0100 4bb7 4b8c 0000 0000 c01b 52c4 0000 9fee d9ef 0100 4bb7 29c8 8c9d 0015 3fa4 0016 1ec8 28c4 0020
3433240 0016 1f4c 5d10 0000 0100 4bb7 4b9c 0000 0000 002b 52c4 0000 a007 8ddf 28c4 0020 0015 6978 5d10 0000 0100 4bb7 4b8c 0000
3433320 0000 0053 52c4 0000 a025 3167 0016 201c 0000 0000 0016 1fbc 0016 1f6c 0002 7069 0000 0000 0200 17a7 29c8 8610 0015 3ef0
3433400 0015 6988 0002 6c6e 0014 8620 28c4 0020 0016 1fcc 5d10 0000 0100 7607 4b8c 0000 0000 0013 52c4 0000 9f98 b90f 0100 4bbf
3433460 29c8 0000 0016 2174 0015 6a90 28c4 0020 0016 1ffc 5d10 0000 0100 7607 4b8c 0000 0000 c01b 52c4 0000 9fc6 4faf 0100 7607
3433540 29c8 0ddf 0015 3f98 0016 1fac 28c4 0020 0015 6a20 5d10 0000 0100 7607 4b8c 0000 0000 0053 52c4 0000 a009 aec7 0200 0b3f
3433620 29c8 0ddf 0015 3f8c 0015 6a30 28c4 0028 0016 2054 5d10 0000 0100 7607 5a18 0000 0100 7607 4b8c 0000 0000 0013 52c4 0000
3433700 df5d d3cf 28c4 0018 0016 208c 4e1c 0000 0000 760f 52c4 0000 a024 87ef 28c4 0020 0015 6b88 5d10 0000 0100 7607 4b8c 0000
3433760 0000 7617 52c4 0000 9f7b 30b7 28c4 0028 0016 20b4 5d10 0000 0200 0b3f 4b8c 0000 0000 760f 4b8c 0000 0000 05a3 52c4 0000
3434040 9e47 7d1f 28c4 0028 0016 20e8 5d10 0000 0200 0b3f 4b8c 0000 0000 000b 4b8c 0000 0000 760f 52c4 0000 9f51 7cc7 2aa8 0007
3434120 0016 21cc 0016 23c4 28c4 0028 0016 211c 5d10 0000 0200 17a7 4b8c 0000 0000 760f 4b8c 0000 0000 0013 52c4 0000 a08e f4f7
3434200 2aa8 0007 0016 2200 0016 20f8 28c4 c020 0016 2148 5d10 0000 0100 4bb7 4b8c 0000 0000 760f 52c4 0000 9ff1 6fe7 2b24 2129
3434260 0002 438a 0016 212c 28c4 0020 0015 6a80 5d10 0000 0100 7607 4b8c 0000 0000 760f 52c4 0000 9fc9 4347 2aa8 0007 0016 228c
3434340 0016 2158 2aa8 215e 0016 2180 0015 6ac0 2b24 2166 0002 438a 0015 6af0 28c4 0018 0016 21a4 4e1c 0000 0000 5a9f 52c4 0000
3434420 a016 fc2f 28c4 0028 0016 21d8 5d10 0000 0200 0b3f 4b8c 0000 0000 000b 4b8c 0000 0000 5a9f 52c4 0000 9f5e 2d5f 2aa8 0007
3434500 0016 2298 0016 21b4 28c4 0028 0015 6b10 5d10 0000 0200 17a7 4b8c 0000 0000 5a9f 4b8c 0000 0000 0013 52c4 0000 a076 3997
3434560 2aa8 2a87 0016 220c 0016 21e8 2aa8 8b9c 0016 2260 0015 6b20 28c4 0018 0016 2238 4e1c 0000 0000 4bbf 52c4 0000 9f89 e237
3434640 0016 2224 0016 1f74 28c4 0028 0016 2274 5d10 0000 0200 17a7 4b8c 0000 0000 5a9f 4b8c 0000 0000 4bbf 52c4 0000 9ff1 fd17
3434720 2b24 866c 0002 438a 0016 2248 0003 7068 6900 2a87 28c4 0018 0016 206c 4e1c 0000 0000 7617 52c4 0000 9fe7 8ddf 2b24 0ad7
3435000 0002 438a 0016 207c 2b24 2a87 0002 438a 0015 6b98 28c4 0020 0016 22d4 5d10 0000 0100 4c0f 4b8c 0000 0000 000b 52c4 0000
3435060 9fab b557 0016 2360 0000 0000 0016 22b0 0016 22c4 28c4 0020 0016 22fc 5d10 0000 0100 4c2f 4b8c 0000 0000 000b 52c4 0000
3435140 9f85 28a7 0004 7a65 7461 0007 2954 0020 0002 438a 5d10 0000 0100 761f 4b8c 0000 0000 001b 52c4 0000 9fcc ee87 0016 2198
3435220 0000 000c 0016 2308 0016 231c 0010 a98c 0000 0000 0015 a708 0016 232c 0016 245c 0000 002c b288 b66c 0000 1008 7fff ffff
3435300 0016 4ca4 0200 0db5 0100 15ad 0100 33fd 0000 000b 0000 315f 003b 2f68 6f6d 652f 6f73 6173 312f 612f 7669 6a61 792f 5648
3435360 444c 2f70 6172 7365 722f 7072 6f6c 6f67 2f6e 6577 6e65 772f 7633 2e31 2f73 796e 6f70 7379 7300 6962 003e 2f68 6f6d 652f
```

```
3435440  6f73 6173 312f 612f 7669 6a61 792f 5648 444c 2f70 6172 7365 722f 7072 6f6c 6f67 2f6e 6577 6e65 772f 7633 2e31 2f73 796e
3435520  6f70 7379 732e 706c 0020 2020 0000 002c 0016 256c b27c b66c 0000 100b 7fff ffff 0015 be04 0200 0db5 0200 2f35 0000 781f
3435600  0000 03e3 0000 315f 0000 002c 0016 4f94 b27c b66c 0000 10a0 7fff ffff 0016 6df0 0200 0db5 0200 224d 0000 781f 0000 3287
3435660  0000 315f 2c78 0012 0002 438a 4e1c 0000 0000 713f 228c 0000 0016 2594 0000 002c b27c b66c 0000 100d 0000 109f 000a d16d
3435740  0200 0db5 0200 270d 0000 781f 0000 3287 0000 315f 002d 2f68 6f6d 652f 6f73 6173 322f 622f 7175 696e 7475 732f 7077 312e
3436020  312f 6c69 6272 6172 792f 6469 7265 6374 6f72 7900 0030 2f68 6f6d 652f 6f73 6173 322f 622f 7175 696e 7475 732f 7077 312e
3436100  312f 6c69 6272 6172 792f 6469 7265 6374 6f72 792e 706c 0061 0039 2f68 6f6d 652f 6f73 6173 322f 622f 7175 696e 7475 732f
3436160  6765 6e65 7269 632f 7170 6c69 6232 2e35 2f6c 6962 7261 7279 2f64 6972 6563 746f 7279 0020 003b 2f68 6f6d 652f 6f73 6173
3436240  322f 622f 7175 696e 7475 732f 6765 6e65 7269 632f 7170 6c69 6232 2e35 2f6c 6962 7251 7279 2f64 6972 6563 746f 7279 2e70
3436320  6c00 0929 0000 002c 0016 6d98 b27c b66c 0000 1010 7fff ffff 0016 23f4 0200 0db5 0200 2f35 0000 783f 0000 03eb 0000 315f
3436400  0016 2b38 0000 0098 b288 b66c 0000 100f 7fff ffff 0016 256c 0200 0db5 0100 15ad 0100 33fd 0000 000b 0000 315f 0016 2600
3436460  0000 0040 b27c b66c 0000 1011 0000 1054 0016 2420 0200 0db5 0500 26f5 0000 1fc7 0000 26ef 0000 03eb 0200 09cd 0000 07cb
3436540  0000 002b 0000 3a2f 0000 315f 0016 2b38 0000 002c b27c b66c 0000 1012 0000 1055 000a d16d 0200 0db5 0200 270d 0000 783f
3436620  0000 20e7 0000 315f 0000 002c 0015 6834 b27c b66c 0000 1014 7fff ffff 0016 5000 0200 0db5 0200 284d 0000 20e7 0000 783f
3436700  0000 315f 0000 0034 0015 68b0 b27c b66c 0000 1015 7fff ffff 0016 2690 0200 0db5 0400 242d 0000 7847 0000 000b 0000 20e7
3436760  0000 21cf 0000 315f 0000 0034 0016 265c b27c b66c 0000 1016 7fff ffff 0016 26c4 0200 0db5 0400 242d 0000 784f 0000 0013
3437040  0000 20e7 0000 21cf 0000 315f 0000 0034 0016 2690 b27c b66c 0000 1017 7fff ffff 0016 26f8 0200 0db5 0400 242d 0000 784f
3437120  0000 001b 0000 20e7 0000 21cf 0000 315f 0000 0034 0016 26c4 b27c b66c 0000 1018 7fff ffff 0016 272c 0200 0db5 0400 242d
3437200  0000 784f 0000 0023 0000 20e7 0000 21cf 0000 315f 0000 0034 0016 26f8 b27c b66c 0000 1019 7fff ffff 0016 2760 0200 0db5
3437260  0400 242d 0000 7857 0000 000b 0000 20e7 0000 21cf 0000 315f 0000 0034 0016 272c b27c b66c 0000 101a 7fff ffff 0016 2794
3437340  0200 0db5 0400 242d 0000 7857 0000 0013 0000 20e7 0000 21cf 0000 315f 0000 0034 0016 2760 b27c b66c 0000 101b 7fff ffff
3437420  0016 27c8 0200 0db5 0400 242d 0000 7857 0000 001b 0000 20e7 0000 21cf 0000 315f 0000 0034 0016 2794 b27c b66c 0000 101c
3437500  7fff ffff 0016 27fc 0200 0db5 0400 242d 0000 785f 0000 0013 0000 20e7 0000 21cf 0000 315f 0000 0034 0016 27c8 b27c b66c
3437560  0000 101d 7fff ffff 0016 2830 0200 0db5 0400 242d 0000 785f 0000 001b 0000 20e7 0000 21cf 0000 315f 0000 0034 0016 27fc
3437640  b27c b66c 0000 101e 7fff ffff 0016 2864 0200 0db5 0400 242d 0000 7867 0000 0013 0000 20e7 0000 21cf 0000 315f 0000 0034
3437720  0016 2830 b27c b66c 0000 101f 7fff ffff 0016 2898 0200 0db5 0400 242d 0000 7867 0000 001b 0000 20e7 0000 21cf 0000 315f
3440000  0000 0034 0016 2864 b27c b66c 0000 1020 7fff ffff 0016 28cc 0200 0db5 0400 242d 0000 7867 0000 0023 0000 20e7 0000 21cf
3440060  0000 315f 0000 0034 0016 2899 b27c b66c 0000 1021 7fff ffff 0016 2900 0200 0db5 0400 242d 0000 786f 0000 000b 0000 20e7
3440140  0000 21cf 0000 315f 0000 0034 0016 28cc b27c b66c 0000 1022 7fff ffff 0016 2934 0200 0db5 0400 242d 0000 786f 0000 0013
3440220  0000 20e7 0000 21cf 0000 315f 0000 0034 0016 2900 b27c b66c 0000 1023 7fff ffff 0016 2968 0200 0db5 0400 242d 0000 786f
3440300  0000 001b 0000 20e7 0000 21cf 0000 315f 0000 0034 0016 2934 b27c b66c 0000 1024 7fff ffff 0016 299c 0200 0db5 0400 242d
3440360  0000 7877 0000 0013 0000 20e7 0000 21cf 0000 315f 0000 0034 0016 2968 b27c b66c 0000 1025 7fff ffff 0016 502c 0200 0db5
3440440  0400 242d 0000 7877 0000 001b 0000 20e7 0000 21cf 0000 315f 0000 0034 0015 fe98 b27c b66c 0000 1026 7fff ffff 0016 2a04
3440520  0200 0db5 0400 24ad 0000 3ad7 0000 0013 0000 20e7 0000 3a8f 0000 315f 0000 0034 0016 29d0 b27c b66c 0000 1027 7fff ffff
3440600  0016 2a38 0200 0db5 0400 24ad 0000 70af 0000 0013 0000 20e7 0000 70af 0000 315f 0000 0034 0016 2a04 b27c b66c 0000 1028
3440660  7fff ffff 0016 2a6c 0200 0db5 0400 24ad 0000 70e7 0000 0013 0000 20e7 0000 70af 0000 315f 0000 0034 0016 2a38 b27c b66c
3440740  0000 1029 7fff ffff 0016 2aa0 0200 0db5 0400 24ad 0000 400f 0000 0013 0000 20e7 0000 400f 0000 315f 0000 0034 0016 2a6c
3441020  b27c b66c 0000 102b 7fff ffff 0016 2a44 0200 0db5 0400 24ad 0000 28ef 0000 001b 0000 20e7 0000 31c7 0000 315f 0000 0034
3441100  0016 2aa0 b27c b66c 0000 102c 7fff ffff 0016 2b08 0200 0db5 0400 24ad 0000 2907 0000 0023 0000 20e7 0000 31c7 0000 315f
3441160  0000 0034 0016 2ad4 b27c b66c 0000 102d 7fff ffff 0016 5198 0200 0db5 0400 24ad 0000 2917 0000 001b 0000 20e7 0000 31c7
3441240  0000 315f 0016 3124 0000 05b0 b288 b65c 0000 102a 7fff ffff 0016 2b08 0200 0db5 0100 15ad 0100 33fd 0200 0b3d 0000 1ff7
3441320  0000 000b 0000 315f 0016 2ba0 0000 0034 b288 b66c 0000 102a 7fff ffff 0016 2b3c 0200 0db5 0100 15ad 0100 33fd 0200 0b3d
3441400  0000 240f 0000 000b 0000 315f 0016 2bd4 0000 0034 b288 b66c 0000 102a 7fff ffff 0016 2b70 0200 0db5 0100 15ad 0100 33fd
3441460  0200 0b3d 0000 2c1f 0000 000b 0000 315f 0016 2c08 0000 0034 b288 b66c 0000 102a 7fff ffff 0016 2ba4 0200 0db5 0100 15ad
3441540  0100 33fd 0200 0b3d 0000 2edf 0000 000b 0000 315f 0016 2c3c 0000 0034 b288 b66c 0000 102a 7fff ffff 0016 2bd8 0200 0db5
3441620  0100 15ad 0100 33fd 0200 0b3d 0000 301f 0000 000b 0000 315f 0016 2c70 0000 0034 b288 b66c 0000 102a 7fff ffff 0016 2c0c
3441700  0200 0db5 0100 15ad 0100 33fd 0200 0b3d 0000 309f 0000 0013 0000 315f 0016 2ca4 0000 0034 b288 b66c 0000 102a 7fff ffff
3441760  0016 2c40 0200 0db5 0100 15ad 0100 33fd 0200 0b3d 0000 28a7 0000 001b 0000 315f 0016 2cd8 0000 0034 b288 b66c 0000 102a
3442040  7fff ffff 0016 2c74 0200 0db5 0100 15ad 0100 33fd 0200 0b3d 0000 28a7 0000 0023 0000 315f 0016 2d0c 0000 0034 b288 b66c
3442120  0000 102a 7fff ffff 0016 2ca8 0200 0db5 0100 15ad 0100 33fd 0200 0b3d 0000 2ecf 0000 001b 0000 315f 0016 2d40 0000 0034
3442200  b288 b66c 0000 102a 7fff ffff 0016 2cdc 0200 0db5 0100 15ad 0100 33fd 0200 0b3d 0000 2ecf 0000 0023 0000 315f 0016 2d74
3442260  0000 0034 b288 b66c 0000 102a 7fff ffff 0016 2d10 0200 0db5 0100 15ad 0100 33fd 0200 0b3d 0000 28af 0000 001b 0000 315f
3442340  0016 2da8 0000 0034 b288 b66c 0000 102a 7fff ffff 0016 2d44 0200 0db5 0100 15ad 0100 33fd 0200 0b3d 0000 28b7 0000 002b
3442420  0000 315f 0016 2ddc 0000 0034 b288 b66c 0000 102a 7fff ffff 0016 2d78 0200 0db5 0100 15ad 0100 33fd 0200 0b3d 0000 28bf
3442500  0000 001b 0000 315f 0016 2e10 0000 0034 b288 b66c 0000 102a 7fff ffff 0016 2dac 0200 0db5 0100 15ad 0100 33fd 0200 0b3d
```

| | | | | | | | | | | | | | | | | | | | | | | | | |
|---|---|---|---|---|---|---|---|---|---|---|---|---|---|---|---|---|---|---|---|---|---|---|---|---|
| 3442560 | 0000 | 28c7 | 0000 | 001b | 0000 | 315f | 0016 | 2e44 | 0000 | 0034 | b288 | b66c | 0000 | 102a | 7fff | ffff | 0016 | 2de0 | 0200 | 0db5 | 0100 | 15ad | 0100 | 33fd |
| 3442640 | 0200 | 0b3d | 0000 | 28cf | 0000 | 001b | 0000 | 315f | 0016 | 2e78 | 0000 | 0034 | b288 | b66c | 0000 | 102a | 7fff | ffff | 0016 | 2e14 | 0200 | 0db5 | 0100 | 15ad |
| 3442720 | 0100 | 33fd | 0200 | 0b3d | 0000 | 28d7 | 0000 | 001b | 0000 | 315f | 0016 | 2eac | 0000 | 0034 | b288 | b66c | 0000 | 102a | 7fff | ffff | 0016 | 2e48 | 0200 | 0db5 |
| 3443000 | 0100 | 15ad | 0100 | 31fd | 0200 | 0b3d | 0000 | 28df | 0000 | 001b | 0000 | 315f | 0016 | 2ee0 | 0000 | 0034 | b288 | b66c | 0000 | 102a | 7fff | ffff | 0016 | 2e7c |
| 3443060 | 0200 | 0db5 | 0100 | 15ad | 0100 | 33fd | 0200 | 0b3d | 0000 | 28e7 | 0000 | 001b | 0000 | 315f | 0016 | 2f14 | 0000 | 0034 | b288 | b66c | 0000 | 102a | 7fff | ffff |
| 3443140 | 0016 | 2eb0 | 0200 | 0db5 | 0100 | 15ad | 0100 | 33fd | 0200 | 0b3d | 0000 | 28ef | 0000 | 001b | 0000 | 315f | 0016 | 2f48 | 0000 | 0034 | b288 | b66c | 0000 | 102a |
| 3443220 | 7fff | ffff | 0016 | 2ee4 | 0200 | 0db5 | 0100 | 15ad | 0100 | 33fd | 0200 | 0b3d | 0000 | 28f7 | 0000 | 001b | 0000 | 315f | 0016 | 2f7c | 0000 | 0034 | b288 | b66c |
| 3443300 | 0000 | 102a | 7fff | ffff | 0016 | 2f18 | 0200 | 0db5 | 0100 | 15ad | 0100 | 33fd | 0200 | 0b3d | 0000 | 28ff | 0000 | 001b | 0000 | 315f | 0016 | 2fb0 | 0000 | 0034 |
| 3443360 | b288 | b66c | 0000 | 102a | 7fff | ffff | 0016 | 2f4c | 0200 | 0db5 | 0100 | 15ad | 0100 | 33fd | 0200 | 0b3d | 0000 | 2907 | 0000 | 0023 | 0000 | 315f | 0016 | 2fe4 |
| 3443440 | 0000 | 0034 | b288 | b66c | 0000 | 102a | 7fff | ffff | 0016 | 2f80 | 0200 | 0db5 | 0100 | 15ad | 0100 | 33fd | 0200 | 0b3d | 0000 | 290f | 0000 | 001b | 0000 | 315f |
| 3443520 | 0016 | 3018 | 0000 | 0034 | b288 | b66c | 0000 | 102a | 7fff | ffff | 0016 | 2fb4 | 0200 | 0db5 | 0100 | 15ad | 0100 | 33fd | 0200 | 0b3d | 0000 | 2917 | 0000 | 001b |
| 3443600 | 0000 | 315f | 0016 | 304c | 0000 | 0034 | b288 | b66c | 0000 | 102a | 7fff | ffff | 0016 | 2fe8 | 0200 | 0db5 | 0100 | 15ad | 0100 | 33fd | 0200 | 0b3d | 0000 | 291f |
| 3443660 | 0000 | 001b | 0000 | 315f | 0016 | 3084 | 0000 | 0038 | b27c | b66c | 0000 | 102e | 0000 | 1058 | 0016 | 30b4 | 0200 | 0db5 | 0500 | 1cdd | 0000 | 2def | 0000 | 000b |
| 3443740 | 0000 | 20e7 | 00b5 | 8823 | 0000 | 03eb | 0000 | 315f | 0016 | 30b0 | 0000 | 002c | b4f0 | b4e4 | 0000 | 102d | 7fff | ffff | 0008 | b0dd | 0000 | 0000 | 0000 | 0000 |
| 3444020 | 0016 | 3e7c | 0002 | 438a | 0016 | bd64 | 0016 | 3124 | 0000 | 0038 | b27c | b66c | 0000 | 1030 | 0000 | 1059 | 0016 | 3128 | 0200 | 0db5 | 0500 | 1cdd | 0000 | 784f |
| 3444100 | 0000 | 0013 | 0000 | 20e7 | 00b4 | 6d43 | 0000 | 03eb | 0000 | 315f | 2c78 | 003c | 0002 | 438a | 45c4 | 4700 | 3280 | 247c | 0016 | 8478 | 0018 | 394c | 001c | 3930 |
| 3444160 | 0018 | 4210 | 0004 | 0003 | 4268 | 0000 | 0002 | 0003 | 4254 | 0000 | 0000 | 0a87 | 3cf4 | 234c | 0016 | b1c8 | 0016 | 318c | 0000 | 0038 | b27c | b66c | 0000 | 1031 |
| 3444240 | 0000 | 105a | 0016 | 3190 | 0200 | 0db5 | 0500 | 1cdd | 0000 | 784f | 0000 | 001b | 0000 | 20e7 | 00b4 | 6ec3 | 0000 | 03eb | 0000 | 315f | 2c78 | 0030 | 0002 | 438a |
| 3444320 | 370c | 0018 | 3724 | 001c | 427c | 0000 | 0004 | 0003 | 4268 | 0000 | 0002 | 0003 | 4254 | 0000 | 0000 | 0a87 | 239c | 0000 | 0016 | b1c8 | 0016 | 3234 | 0000 | 0070 |
| 3444400 | b27c | b66c | 0000 | 1032 | 0000 | 105b | 0016 | 31c8 | 0200 | 0db5 | 0500 | 1cdd | 0000 | 784f | 0000 | 0023 | 0000 | 20e7 | 00b4 | 6fc3 | 0000 | 03eb | 0000 | 315f |
| 3444460 | 0016 | 3234 | 0000 | 0038 | b27c | b66c | 0000 | 1033 | 0000 | 105c | 0016 | 3238 | 0200 | 0db5 | 0500 | 1cdd | 0000 | 7857 | 0000 | 000b | 0000 | 20e7 | 00b4 | 70c3 |
| 3444540 | 0000 | 03eb | 0000 | 315f | 2c78 | 0038 | 0002 | 438a | 45c4 | 3280 | 24d0 | 0000 | 0016 | 8d78 | 0014 | 3930 | 0018 | 4210 | 0004 | 0003 | 4268 | 0000 | 0002 | 0003 |
| 3444620 | 4254 | 0000 | 0000 | 0a87 | 3cf4 | 234c | 0016 | b248 | 0016 | 3298 | 0000 | 0038 | b27c | b66c | 0000 | 1034 | 0000 | 105d | 0016 | 329c | 0200 | 0db5 | 0500 | 1cdd |
| 3444700 | 0000 | 7857 | 0000 | 0013 | 0000 | 20e7 | 00b4 | 7243 | 0000 | 03eb | 0000 | 315f | 2c78 | 002c | 0002 | 438a | 370c | 0018 | 427c | 0000 | 0004 | 0003 | 4268 | 0000 |
| 3444760 | 0002 | 0003 | 4254 | 0000 | 0000 | 0a87 | 239c | 0000 | 0016 | b248 | 0016 | 3344 | 0000 | 0070 | b27c | b66c | 0000 | 1035 | 0000 | 105e | 0016 | 32d4 | 0200 | 0db5 |
| 3445040 | 0500 | 1cdd | 0000 | 7857 | 0000 | 001b | 0000 | 20e7 | 00b4 | 7343 | 0000 | 03eb | 0000 | 315f | 0016 | 3344 | 0000 | 0038 | b27c | b66c | 0000 | 1036 | 0000 | 105f |
| 3445120 | 0016 | 3348 | 0200 | 0db5 | 0500 | 1cdd | 0000 | 7867 | 0000 | 0013 | 0000 | 20e7 | 00b4 | 76c3 | 0000 | 03eb | 0000 | 315f | 2c78 | 003c | 0002 | 438a | 45c4 | 4700 |
| 3445200 | 3280 | 247c | 0016 | 8178 | 0018 | 394c | 001c | 3930 | 0018 | 4210 | 0002 | 0003 | 4268 | 0000 | 0004 | 0003 | 4254 | 0000 | 0000 | 0a87 | 3cf4 | 234c | 0016 | b1c8 |
| 3445260 | 0016 | 33ac | 0000 | 0038 | b27c | b66c | 0000 | 1037 | 0000 | 1060 | 0016 | 33b0 | 0200 | 0db5 | 0500 | 1cdd | 0000 | 7867 | 0000 | 001b | 0000 | 20e7 | 00b4 | 7843 |
| 3445340 | 0000 | 03eb | 0000 | 315f | 2c78 | 0030 | 0002 | 438a | 370c | 0018 | 3724 | 001c | 427c | 0000 | 0002 | 0003 | 4268 | 0000 | 0004 | 0003 | 4254 | 0000 | 0000 | 0a87 |
| 3445420 | 239c | 0000 | 0016 | b1c8 | 0016 | 3454 | 0000 | 0070 | b27c | b66c | 0000 | 1038 | 0000 | 1061 | 0016 | 33e8 | 0200 | 0db5 | 0500 | 1cdd | 0000 | 7867 | 0000 | 0023 |
| 3445500 | 0000 | 20e7 | 00b4 | 7943 | 0000 | 03eb | 0000 | 315f | 0016 | 3454 | 0000 | 0038 | b27c | b66c | 0000 | 1039 | 0000 | 1062 | 0016 | 3458 | 0200 | 0db5 | 0500 | 1cdd |
| 3445560 | 0000 | 786f | 0000 | 000b | 0000 | 20e7 | 00b4 | 7a43 | 0000 | 03eb | 0000 | 315f | 2c78 | 0038 | 0002 | 438a | 45c4 | 3280 | 24d0 | 0000 | 0016 | 8d78 | 0014 | 3930 |
| 3445640 | 0018 | 4210 | 0002 | 0003 | 4268 | 0000 | 0004 | 0003 | 4254 | 0000 | 0000 | 0a87 | 3cf4 | 234c | 0016 | b248 | 0016 | 34b8 | 0000 | 0038 | b27c | b66c | 0000 | 103a |
| 3445720 | 0000 | 1063 | 0016 | 34bc | 0200 | 0db5 | 0500 | 1cdd | 0000 | 786f | 0000 | 0013 | 0000 | 20e7 | 00b4 | 7bc3 | 0000 | 03eb | 0000 | 315f | 2c78 | 002c | 0002 | 438a |
| 3446000 | 370c | 0018 | 427c | 0000 | 0002 | 0003 | 4268 | 0000 | 0004 | 0003 | 4254 | 0000 | 0000 | 0a87 | 239c | 0000 | 0016 | b248 | 0016 | 376c | 0000 | 0070 | b27c | b66c |
| 3446060 | 0000 | 103b | 0000 | 1064 | 0016 | 34f4 | 0200 | 0db5 | 0500 | 1cdd | 0000 | 786f | 0000 | 001b | 0000 | 20e7 | 00b4 | 7cc3 | 0000 | 03eb | 0000 | 315f | 0016 | 376c |
| 3446140 | 0000 | 0038 | b27c | b66c | 0000 | 103c | 0000 | 1065 | 0016 | 3770 | 0200 | 0db5 | 0500 | 1cdd | 0000 | 787f | 0000 | 0033 | 0000 | 20e7 | 00b5 | 8e43 | 0000 | 03eb |
| 3446220 | 0000 | 315f | 27f0 | 0094 | 0016 | 35b8 | 45b8 | 4cc4 | 0000 | 0a87 | 4754 | 47d0 | 4864 | 0018 | 4880 | 001c | 001c | 9350 | 001c | 9410 | 3050 | 32f0 | 0020 | 5aec |
| 3446300 | 0600 | 787f | 6d0c | 43f8 | 0000 | 0a87 | 6d50 | 6d94 | 6dd8 | 6e1c | 001c | 3894 | 0020 | 41e8 | 0000 | 001b | 3ba0 | 0000 | 0008 | ce1c | 0024 | 3894 | 0020 | 41e8 |
| 3446360 | 0000 | 0023 | 3bf4 | 0000 | 0008 | ce1c | 0024 | 3eec | 0020 | 41e8 | 0000 | 0033 | 3af4 | 001c | 0008 | cebc | 0020 | 4290 | 0000 | 001c | 0000 | 0003 | 3984 | 0018 |
| 3446440 | 001c | 2304 | 0016 | b36c | 28c4 | 00c4 | 0016 | 367c | 45b8 | 46ec | 4768 | 47e4 | 4880 | 0018 | 001c | 4880 | 001c | 0020 | 9350 | 001c | 9410 | 3050 | 32f0 | 0024 |
| 3446520 | 5d10 | 0000 | 0600 | 787f | 6d0c | 6d50 | 6d94 | 6dd8 | 6e1c | 001c | 6e1c | 0020 | 3894 | 0024 | 4254 | 0000 | 0000 | 000b | 3b4c | 0000 | 0008 | cebc | 0028 | 3894 |
| 3446600 | 0024 | 41e8 | 0000 | 0013 | 3ba0 | 0000 | 0008 | cebc | 0028 | 3894 | 0024 | 41e8 | 0000 | 001b | 3bf4 | 0000 | 0008 | ce1c | 0028 | 3894 | 0024 | 41e8 | 0000 | 0023 |
| 3446660 | 3c48 | 0000 | 0008 | ce1c | 0028 | 3eec | 0024 | 41e8 | 0000 | 002b | 3af4 | 001c | 0008 | cebc | 0024 | 4290 | 0000 | 0020 | 0000 | 0003 | 3984 | 001c | 0020 | 3984 |
| 3446740 | 0018 | 001c | 23e4 | 0000 | 0016 | b398 | 2954 | 00ec | 0002 | 438a | 45e8 | 0024 | 4728 | 0028 | 4790 | 002c | 47f8 | 0030 | 482c | 0018 | 4810 | 001c | 32f0 | 0020 |
| 3447020 | 5d10 | 0000 | 0600 | 787f | 6e1c | 0024 | 6e1c | 0028 | 6e1c | 002c | 6e1c | 0030 | 6d50 | 6d0c | 3894 | 0020 | 4254 | 0000 | 0000 | 000b | 3af4 | 0024 | 0008 | cebc |
| 3447100 | 0034 | 3894 | 0020 | 41e8 | 0000 | 0013 | 3af4 | 0028 | 0008 | cebc | 0034 | 3894 | 0020 | 41e8 | 0000 | 001b | 3af4 | 002c | 0008 | ce1c | 0034 | 3894 | 0020 | 41e8 |
| 3447160 | 0000 | 0023 | 3af4 | 0030 | 0008 | ce1c | 0034 | 3540 | 0018 | 001c | 38fc | 0030 | 3894 | 002c | 382c | 0028 | 3af4 | 0024 | 0016 | b3c4 | 0024 | 3e70 | 0020 | 411c |
| 3447240 | 0000 | 001c | 000c | aec4 | 001c | 32d4 | 24d0 | 0000 | 0016 | b3e4 | 001c | 3348 | 4108 | 0000 | 0008 | e2bc | 0018 | 3d3c | 447c | 0000 | 0200 | 0ad7 | 6d50 | 6d0c |
| 3447320 | 242c | 0000 | 000b | 8888 | 0016 | 3868 | 0000 | 0038 | b27c | b66c | 0000 | 103d | 0000 | 1066 | 0016 | 386c | 0200 | 0db5 | 0500 | 1cdd | 0000 | 787f | 0000 | 002b |
| 3447400 | 0000 | 20e7 | 00b5 | 9243 | 0000 | 03eb | 0000 | 315f | 2c78 | 00c4 | 0002 | 438a | 45e8 | 001c | 4728 | 0020 | 4790 | 0024 | 47f8 | 0028 | 482c | 0018 | 32d4 | 5aec |
| 3447460 | 0500 | 787f | 6e1c | 001c | 6e1c | 0020 | 6e1c | 0024 | 6e1c | 0028 | 6d50 | 3880 | 4254 | 0000 | 0000 | 000b | 3af4 | 001c | 0008 | cebc | 002c | 3880 | 4254 | 0000 |
| 3447540 | 0000 | 0013 | 3af4 | 0020 | 0008 | cebc | 002c | 3880 | 4254 | 0000 | 0000 | 001b | 3af4 | 0024 | 0008 | ce1c | 002c | 3880 | 4254 | 0000 | 0000 | 0023 | 3af4 | 0028 |
| 3447620 | 0008 | ce1c | 002c | 3500 | 0018 | 38fc | 0028 | 3894 | 0024 | 382c | 0020 | 3c9c | 0000 | 001c | 0016 | b3c4 | 001c | 3d48 | 40f4 | 0000 | 000c | aec4 | 0014 | 3280 |

1931 1932

```
3447700  24d0 0000 0016 b3e4 0014 37f0 3cf4 234c 0008 e2bc 0016 38d0 0000 0038 b27c b66c 0000 103e 0000 1067 0016 38d4 0200 0db5
3447760  0500 1cdd 0000 787f 0000 000b 0000 20e7 00b5 9f23 0000 03eb 0000 315f 27f0 0030 0016 4b8c 56f8 671c 682c 5aec 0200 0ad7
3450040  6044 41fc 0000 0003 24d0 0000 0016 b428 0010 2ecc 2420 0000 0016 b3e4 0016 39e4 0000 00e0 b27c b66c 0000 103f 0000 1068
3450120  0016 390c 0200 0db5 0500 1cdd 0000 785f 0000 0013 0000 20e7 00b4 7443 0000 03eb 0000 315f 0016 3940 0000 0038 b27c b66c
3450200  0000 1040 0000 1069 0016 3944 0200 0db5 0500 1cdd 0000 785f 0000 001b 0000 20e7 00b4 75c3 0000 03eb 0000 315f 0016 3978
3450260  0000 0038 b27c b66c 0000 1041 0000 106a 0016 397c 0200 0db5 0500 1cdd 0000 7877 0000 0013 0000 20e7 00b4 7e23 0000 03eb
3450340  0000 315f 0016 39e4 0000 0038 b27c b66c 0000 1042 0000 106b 0016 39e8 0200 0db5 0500 1cdd 0000 7877 0000 001b 0000 20e7
3450420  00b4 7fa3 0000 03eb 0000 315f 0030 7e4e 2120 7e77 2069 7320 6e6f 7420 6128 6e29 207e 7720 7e77 2070 726f 7065 7274 792e
3450500  7e6e 2120 476f 616c 3a20 7e77 7e6e 0007 0016 3bc0 0000 0078 b27c b66c 0000 1043 0000 106c 0016 3bc4 0200 01b5 0500 1cdd
3450560  0000 788f 0000 002b 0000 20e7 00b5 a583 0000 03eb 0000 315f 0016 3bc0 0000 0040 0016 b63c 0000 0000 0000 0000 0000 0000
3450640  0000 0000 0000 0000 0000 0000 0000 0000 0016 b120 0016 b7c1 0000 0000 0000 0000 0016 b4e8 0016 b228 2c78 0162 0002 438a
3450720  45e8 0028 4728 0034 4790 002c 47d0 4810 0019 31d4 0030 32f0 0024 5aec 0500 788f 6e1c 0028 6e1c 0034 6e1c 002c 6d94 6d0c
3451000  3894 0024 4254 0000 0000 000b 3af4 0028 0008 cebc 003c 38fc 0024 41fc 0000 001b 4538 4af8 0000 20e7 5370 4550 4b8c 0000
3451060  0000 2247 6b74 3c9c 0000 002c 0008 ce7c 003c 9350 0034 93a8 0006 2c88 0080 2e7c ae74 0038 2ba0 003c 0020 38fc 0030 386c
3451140  382c 002c 3af4 0034 0016 b304 003c aa88 0038 2e98 2c88 0056 2c58 2e7c ac08 2ba0 0038 0012 3804 4cc4 0000 78cf a858 2e98
3451220  2c88 0004 2c58 4538 6e1c 0024 5370 4550 6e1c 002c 6b74 4538 6d94 6bb4 4568 6e1c 0034 6b74 4254 0000 0000 78d7 4300 0000
3451300  0000 328f 0008 c11c 0038 c5a8 39fc 0030 386c 382c 002c 3c9c 0000 0034 0016 b304 0034 3540 001c 0020 3540 0019 001c 3484
3451360  3eec 0030 382c 002c 3af4 0028 0016 b574 0028 3e70 0024 411c 0000 0023 000c aec4 0020 344c 3eec 001c 3d48 3a4c 0016 b594
3451440  0014 3d00 4a7c 000c 723c 3bc6 0016 3cf4 0000 0038 b27c b66c 0000 1044 0000 106d 0016 3cf8 0200 0db5 0500 1cdd 0000 7887
3451520  0000 0023 0000 20e7 00b5 aca3 0000 03eb 0000 315f 27f0 003a 0016 b5dc 4e1c 0000 0000 78c7 2520 47a8 a890 aab4 0001 9f24
3451600  aab4 0000 a1d0 000c 3774 4c70 0000 222f 723c 3774 4e1c 0000 0000 315f 723c 0ddf 28c4 0068 0016 3c98 4e1c 0000 0000 78e7
3451660  2520 4740 3500 0018 4268 0000 0000 3287 37dc 42ac 0000 0203 0016 b62c 0019 34e0 0018 3d9c 4268 0000 0000 78ef 37dc 42ac
3451740  0000 0043 0016 b62c 0014 43a4 0018 3d90 4268 0000 0000 78f7 37dc 41d4 0000 000b 242c 0000 0016 b62c 28c4 002c 0016 3cc4
3452020  4e1c 0000 0000 3287 3588 3664 427c 0000 0000 0003 4254 0000 0000 0003 239c 0000 0016 b670 28c4 002c 0016 b6a8 4e1c 0000
3452100  0000 78ef 3588 3664 427c 0000 0000 0003 4254 0000 0000 000b 239c 0000 0016 b670 0016 3e24 0000 00a8 b27c b66c 0000 1045
3452160  0000 106e 0016 3d30 0200 0db5 0500 1cdd 0000 7897 0000 002b 0000 20e7 00b5 b163 0000 03eb 0000 315f 0016 3d64 0000 0038
3452240  b27c b66c 0000 1046 0000 106f 0016 3d68 0200 0db5 0500 1cdd 0000 788f 0000 0023 0000 20e7 00b5 9823 0000 03eb 0000 315f
3452320  0016 3e78 0000 0038 b27c b66c 0000 1047 0000 1070 0016 3e7c 0200 0db5 0500 1cdd 0000 22df 0000 0013 0000 20e7 00b5 e5e3
3452400  0000 03eb 0000 315f 0005 544f 5441 4c00 0016 b754 0016 b7a8 0016 b7e4 0016 b824 0016 b854 0016 b898 0016 b8cc 0016 b900
3452460  0016 b934 0016 b968 0016 b873 0016 b9ac 0016 b9d8 0016 ba08 0016 ba3c 0016 ba74 0016 baa8 0016 bad8 0016 bb10 0016 bb48
3452540  0016 bb80 0016 bbb4 0016 bbe8 0016 bc18 0016 bc4c 0016 bc7c 0000 0000 0000 0000 0000 0000 0000 0000 0000 0000 0000 0000
3452620  0016 42b4 0000 03a4 5d10 0000 0100 3037 4b8c 0000 0000 79d7 5758 4af8 0000 78b7 55f0 4af8 0000 78bf 55f0 4af8 0000 78a7
3452700  55f0 4af8 0000 78af 55f0 4af8 0000 78ff 55f0 4af8 0000 79df 55f0 4af8 0000 79df 5370 228c 0016 3eb0 0000 0038 b130 b66c
3452760  0000 1048 0000 1071 0016 3089 0200 0db5 0500 1cdd 0000 22d7 0000 0013 0000 20e7 00b5 e883 0000 03eb 0000 315f 0016 3f28
3453040  0000 0078 4e1c 0000 0000 78b7 5d7c 0000 0500 79b7 67ec 0018 64a8 6160 5c9c 0018 0100 0ab7 4b8c 0000 0000 2fdf 5e54 0000
3453120  0100 0ab7 4b8c 0000 0000 2fdf 5de8 0000 0100 0ab7 4b8c 0000 0000 253f 5d7c 0000 0100 0ab7 4b8c 0000 0000 253f 56f8 671c
3453200  5370 5aec 0100 0ad7 4b8c 0000 0000 253f 228c 0007 0016 3f7c 0000 0054 4e1c 0000 0000 78bf 5d7c 0000 0300 78bf 6784 6160
3453260  5de8 0000 0100 0ad7 4b8c 0000 0000 2fdf 5d7c 0000 0100 0ad7 4b8c 0000 0000 2fdf 56f8 671c 5370 5aec 0100 0ad7 4b8c 0000
3453340  0000 253f 228c 3f5e 0016 4008 0000 008c 4e1c 0000 0000 79a7 5d7c 0000 0600 78a7 66c0 001c 0018 64a8 6160 5ec0 0000 001c
3453420  0100 0ad7 4b8c 0000 0000 2fdf 5c9c 0018 0100 0ab7 4b8c 0000 0000 253f 5e54 0000 0100 0ab7 4b8c 0000 0000 253f 5de8 0000
3453500  0100 0ad7 4b8c 0000 0000 2fdf 5d7c 0000 0100 0ab7 4b8c 0000 0000 2fdf 56f8 671c 5370 5aec 0100 0ad7 4b8c 0000 0000 253f
3453560  228c 22cf 0016 40a8 0000 00a0 4e1c 0000 0000 78af 5d7c 0000 0700 78af 67ec 0020 66c0 001c 0018 64a8 6160 5ec0 0000 0020
3453640  0100 0ab7 4b8c 0000 0000 2fdf 5c9c 001c 0100 0ab7 4b8c 0000 0000 2fdf 5c9c 0018 0100 0ab7 4b8c 0000 0000 253f 5e54 0000
3453720  0100 0ab7 4b8c 0000 0000 253f 5de8 0000 0100 0ab7 4b8c 0000 0000 2fdf 5d7c 0000 0100 0ad7 4b8c 0000 0000 2fdf 56f8 671c
3454000  5370 5aec 0100 0ad7 4b8c 0000 0000 253f 228c 3cc6 0016 410c 0000 0064 4e1c 0000 0000 78ff 5d7c 0000 0400 78ff 64a8 6160
3454060  5e54 0000 0100 0ab7 4b8c 0000 0000 253f 5de8 0000 0100 0ab7 4b8c 0000 0000 253f 5d7c 0000 0100 0ad7 4b8c 0000 0000 2fdf
3454140  56f8 671c 5370 5aec 0100 0ad7 4b8c 0000 0000 253f 228c 43c1 0016 4198 0000 008c 4e1c 0000 0000 78df 5d7c 0000 0600 78df
3454220  66c0 001c 0018 64a8 6160 5ec0 0000 001c 0100 0ab7 4b8c 0000 0000 2fdf 5c9c 0018 0100 0ab7 4b8c 0000 0000 2fdf 5e54 0000
3454300  0100 0ab7 4b8c 0000 0000 253f 5de8 0000 0100 0ad7 4b8c 0000 0000 253f 5d7c 0000 0100 0ad7 4b8c 0000 0000 253f 56f8 671c
3454360  5370 5aec 0100 0ad7 4b8c 0000 0000 253f 228c 0ddf 0016 42b4 0000 0030 4e1c 0000 0000 79df 5d7c 0000 0100 7847 55f0 671c
3454440  5370 5aec 0100 0ad7 4b8c 0000 0000 2fdf 228c 41a6 0043 2f68 6f6d 652f 6f73 6173 322f 622f 7175 696e 7475 732f 6765 6e65
3454520  7269 632f 7170 6c69 6232 2e35 2f6c 6962 7261 7279 2f73 756e 342d 342e 302f 6469 7265 6374 6f72 792e 6f00 0ddf 0041 2f68
3454600  6f6d 652f 6f73 6173 322f 622f 7175 696e 7475 732f 6765 6e65 7269 632f 7170 6c69 6232 2e35 2f6c 6962 7261 7279 2f73 756e
3454660  342d 342f 6469 7265 6374 6f72 792e 6f00 0000 002c 0016 6df0 b27c b66c 0000 1056 7fff ffff 0015 be30 0200 0db5 0200 224d
3454740  0000 783f 0000 20e7 0000 315f 0016 bd70 0013 3c4c 0000 002c 0015 64f4 b27c b66c 0000 1057 7fff ffff 0016 4fd4 0200 0db5
```

```
3455020  0200 24bd 0000 3287 0000 20e7 0000 315f 0016 4ca0 0000 0084 b288 b66c 0000 1053 7fff ffff 0017 7b18 0200 0db5 0100 15ad
3455100  0100 33fd 0000 000b 0000 315f 0016 430c 0000 002c b288 b66c 0000 1053 7fff ffff 0016 42b8 0200 0db5 0100 15ad 0100 33fd
3455160  0000 000b 0000 315f 0016 4ca0 0000 002c b288 b66c 0000 1053 7fff ffff 0016 42e4 0200 0db5 0100 15ad 0100 33fd 0000 000b
3455240  0000 315f 2c78 0010 0002 438a 239c 0000 0016 8dd8 0000 4c0f b328 4320 0015 fe68 0000 0000 0000 4c2f b328 87f1 0015 fe9c
3455320  0000 0000 0000 20e7 b328 43e4 0016 2634 0000 0000 0000 0028 0016 1e38 b27c b66c 0000 0fd1 7fff ffff 0016 b12c 0200 0db5
3455400  0100 32b5 0000 758f 0000 315f 0000 758f b328 0ddf 0016 4380 0000 0000 2c78 0010 0002 438a 239c 0000 0016 8da8 0005 6d75
3455460  7865 7300 2c78 0010 0002 438a 239c 0000 0016 8d78 2c78 0010 0002 438a 239c 0000 0015 fd34 000c 6573 7469 6d61 7465 5f70
3455540  6963 0000 0005 736d 6172 7400 000d 636f 6e76 6572 7369 6f6e 2e70 6c00 000b 589c 0000 7637 0000 3287 0000 0000 0015 ddb8
3455620  0015 ddb8 0001 0078 0000 0000 2c78 0024 0002 438a 370c 0018 3724 001c 373c 0020 3260 0024 3244 3228 320c 22bc 0015 fd74
3455700  0015 fd04 0300 75a7 0000 3287 0000 000c 0014 8424 0014 8424 0041 0000 0000 0000 0015 fd24 0300 75af 0000 3287 0000 000c
3455760  0016 43d4 0016 43d4 0041 0000 0000 0000 0015 fd44 0200 75b7 0000 3287 0000 0008 0016 44b0 0016 44b0 0041 0000 0000 0000
3456040  2c78 0010 0002 438a 239c 0000 0015 fd54 0015 fd64 0800 70af 0000 3287 0000 0020 0016 44e0 0016 44e0 0041 0000 0000 0000
3456120  2c78 0010 0002 438a 239c 0000 0015 fd74 0015 fd84 0400 70df 0000 3287 0000 0010 0016 4510 0016 4510 0041 0000 0000 0000
3456200  2c78 0010 0002 438a 239c 0000 0015 fd94 0006 4465 7369 676e 0016 452c 0007 6361 7363 6164 6500 4538 0007 636c 6963 6b65
3456260  6400 4544 0016 696e 6974 5f65 7374 696d 6174 6573 5f70 6963 7475 7265 0000 0db5 0014 696e 6974 5f64 6573 6967 6e5f 636f
3456340  756e 7465 7273 0007 000b 5bb0 0000 763f 0000 3287 0000 0000 0015 dee8 0015 dee8 0001 0078 0000 0000 000b 5ca4 0300 7647
3456420  0000 3287 0000 000c 0018 41c0 0018 41c0 0001 0087 0000 0000 0013 6469 7370 6c61 795f 6465 7369 676e 5f69 6e66 6f00 45b5
3456500  000b 6214 0200 766f 0000 3287 0000 0008 0016 4600 0016 4600 0001 0078 0000 0000 000a 7072 696e 745f 7668 646c 0016 43c4
3456560  2c78 0024 0002 438a 3574 2520 33bc 3310 24d0 0000 0016 4634 0014 3d30 3cf4 234c 0016 4654 000b 64ac 0300 767f 0000 3287
3456640  0000 000c 000a 18f0 0002 438a 0003 0078 0000 0000 000b 69d8 0200 7687 0000 3287 0000 0008 0015 df88 0015 df88 0001 0078
3456720  0000 0000 000c 6469 7370 6c61 795f 7465 726d 00df 0009 6675 6e63 7469 6f6e 7300 0009 7265 6769 7374 6572 7300 0000 783f
3457000  b328 469e 0016 2570 0000 0000 000b 6afc 0200 768f 0000 3287 0000 0008 0018 7a50 0018 7a50 0001 0084 0000 0000 000c 6465
3457060  7369 676e 5f70 6f70 7570 00df 0012 2031 3e20 2f64 6576 2f6e 756c 6c20 323e 2631 0000 0007 0004 676f 6c64 0007 000b 7228
3457140  0200 76af 0000 3287 0000 0008 0015 e128 0015 e310 0001 0078 0000 0000 000d 6669 6c65 5f70 726f 7065 7274 7900 2c78 0020
3457220  0002 438a 2520 46d8 332c 247c 0016 4ae4 0014 3228 3d30 2340 0016 4b04 000a f26c 0000 0000 0005 202d 6675 2000 0009 7772
3457300  6974 6520 5254 4c00 0009 5f72 746c 2e76 6864 6c00 000b 7a04 0200 76ef 0000 3287 0000 0008 0019 d9f4 0019 d9f4 0001 008c
3457360  0000 0000 000a 7379 6e74 6865 7369 7a65 0000 0ddf 000d 6361 6c6c 5f73 796e 6f70 7379 7300 0025 2020 2020 2053 796e 7468
3457440  6573 697a 6564 2064 6573 6967 6e20 696e 2066 696c 653a 207e 777e 6e00 000b 7b20 0200 7707 0000 3287 0000 0008 0017 a8cc
3457520  0017 a914 0001 007c 0000 0000 0000 77af b328 4ac4 0015 be34 0000 0000 0003 6473 7000 0000 0004 6473 7020 00fc 000b 7d00
3457600  0000 7717 0000 3287 0000 0000 0016 483c 0016 483c 0001 0078 0000 0000 0000 781f b328 0ddf 0016 2424 0000 0000 2c78 0020
3457660  0002 438a 2520 3280 24d0 0000 0014 11e8 0010 3cf4 242c 0000 0016 486c 0016 480c 0100 7717 0000 3287 0000 0004 0015 e4f0
3457740  0015 e4f0 0001 0078 0000 0000 0021 2020 2020 2049 6e69 7469 616c 697a 696e 6720 6469 7370 6c61 7920 7769 6e64 6f77 2e00
3460020  0012 4469 7370 6c61 7969 6e67 2064 6573 6967 6e73 0016 46d6 000f 6d61 785f 6465 7369 676e 5f73 697a 6500 48d6 b464 4bc8
3460100  0016 26fc 0000 0000 000b 7ee8 0200 772f 0000 3287 0000 0008 0016 471c 0016 471c 0001 0078 0000 0000 0016 485c 0400 7717
3460160  0000 3287 0000 0010 0016 4944 0016 4944 0001 0078 0000 0000 2aa8 b1dc 0016 b1d8 0016 77c8 0016 48f8 0700 7717 0000 3287
3460240  0000 001c 0016 4988 0015 e69c 0001 0078 0000 0000 2cac 0007 0002 438a 2ca0 4935 0000 0000 0000 0000 0015 e5b4 0015 e5b4
3460320  0015 e5be 0015 bcf0 0006 6473 702e 706c 0000 0000 2938 0012 0015 e630 4e1c 0000 0000 0007 2edc 0ddf 27f0 0007 0015 e69c
3460400  2ca0 0ddf 0000 0000 0000 0001 0016 4974 0015 e69c 0015 e63a 0016 49ac 0016 4980 000e 6469 7370 6c61 795f 6465 7369 676e
3460460  0016 49a6 000b 7f6c 0500 7737 0000 3287 0000 0014 0015 e704 0015 e704 0001 0078 0000 0000 0003 6e69 6c00 49ce 000a 6d61
3460540  6b65 5f70 6f70 7570 0000 0007 0005 706f 7075 7000 0003 626f 7800 0ddf 0003 7065 6e00 49f6 0006 6669 6775 7265 0016 4a09
3460620  0008 6164 645f 7465 7874 0007 0006 6365 6e74 6572 0000 0007 0006 6465 7669 6365 0000 0007 0000 781f b328 0007 0016 23f8
3460700  0000 0000 0004 6c76 6572 00e8 0016 4a44 0016 473c 0011 4da0 0500 7747 0000 3287 0000 0014 0018 f93c 0018 f93c 0001 0086
3460760  0000 0000 0012 bbbc 0200 776f 0000 3287 0000 0009 0018 464c 0018 bdf4 0001 0087 0000 0000 000c 6465 7369 676e 5f73 697a
3461040  6573 0088 000a 7365 6c65 6374 5f6d 6178 0014 881d 0000 77af b328 0df7 0015 be08 0000 0000 0012 bc3c 0200 7787 0000 3287
3461120  0000 0008 0016 4b38 0016 4b38 0001 0078 0000 0000 0012 bc5c 0300 778f 0000 3287 0000 000c 0018 abf0 0018 abf0 0041 0000
3461200  0000 0000 000c 6573 7469 6d61 7465 732e 706c 0000 27f0 0014 0015 e9bc 4e1c 0000 0000 0007 54a8 228c 2cac 0df7 0002 438a
3461260  2ca0 4b29 0000 0000 0000 0001 0016 4b24 0015 e9bc 0015 e9c6 0016 4b5c 0016 4b30 b464 0000 0016 2904 0016 8fa8 2c78 0012
3461340  0002 438a 4e1c 0000 0000 789f 228c 0000 b464 3e28 0016 2868 0015 3e24 2954 0012 0002 438a 4e1c 0000 0000 0007 228c 4b6c
3461420  0016 4b78 0018 f5cc 0015 bc74 b464 4b84 0016 2800 0000 0000 b464 4bb0 0016 2798 0000 0000 b464 4bbc 0016 2764 0016 4bb8
3461500  b464 48d0 0016 26c8 0016 48cc 0009 6368 6d6f 6420 2b78 2000 0008 7379 6e6f 7073 7973 0000 0007 4841 4c2e 4453 5000 4c00
3461560  0006 4841 4c2e 4655 0016 4c0c 0007 7275 6e5f 6473 7000 4c18 0018 202d 6366 2032 202d 636c 2032 3520 2d74 2030 202d 7220
3461640  3020 00b5 0020 2020 2020 2044 6174 6120 7061 7468 2073 796e 7468 6573 6973 2066 6169 6c65 642e 003d 0012 bd40 0100 77b7
3461720  0000 3287 0000 0004 0015 bef8 0015 bef8 0001 007b 0000 0000 0012 bf40 0100 77ff 0000 3287 0000 0004 0017 9fbc 0017 9fbc
3462000  0001 007e 0000 0000 0016 4b98 0016 4e2c 0000 002c b288 b66c 0000 10ab 7fff ffff 0017 abc8 0200 0db5 0100 15ad 0100 33fd
3462060  0000 000b 0000 315f 0036 2f68 6f6d 652f 6f73 6173 312f 612f 7669 6a61 792f 5648 444c 2f70 6172 7365 722f 7072 6f6c 6f67
```

```
3462140  2f6e 6577 6e65 772f 7633 2e31 2f6c 6273 006b 6520 0039 2f68 6f6d 652f 6f73 6173 312f 612f 7669 6a61 792f 5648 444c 2f70
3462220  6172 7365 722f 7072 6f6c 6f67 2f6e 6577 6e65 772f 7633 2e31 2f6c 6273 2e70 6c00 0037 2f68 6f6d 652f 6f73 6173 312f 612f
3462300  7669 6a61 792f 5648 444c 2f70 6172 7365 722f 7072 6f6c 6f67 2f6e 6577 6e65 772f 7633 2e31 2f6c 7665 7200 2525 003a 2f68
3462360  6f6d 652f 6f73 6173 312f 612f 7669 6a61 792f 5648 444c 2f70 6172 7365 722f 7072 6f6c 6f67 2f6e 6577 6e65 772f 7633 2e31
3462440  2f6c 7665 722e 706c 0069 7374 0000 002c 0016 4f3c b27c b66c 0000 10ae 7fff ffff 0016 6498 0200 0db5 0200 2f35 0000 7cef
3462520  0000 03fb 0000 315f 0000 002c 0017 8024 b27c b66c 0000 1102 7fff ffff 0017 ac28 0200 0db5 0200 2244 0000 7cef 0000 3287
3462600  0000 315f 2954 0014 0002 438a 56f8 6160 239c 0000 0018 a0a4 0016 4f64 0000 002c b27c b66c 0000 10b0 0000 1101 000a d16d
3462660  0200 0db5 0200 270d 0000 7cef 0000 3287 0000 315f 002c 2f68 6f6d 652f 6f73 6173 322f 622f 7175 696e 7475 732f 7077 312e
3462740  312f 6c69 6272 6172 792f 6361 7365 636f 6e76 0020 002f 2f68 6f6d 652f 6f73 6173 322f 622f 7175 696e 7475 732f 7077 312e
3463020  312f 6c69 6272 6172 792f 6361 7365 636f 6e76 2e70 6c00 2856 0037 2f68 6f6d 652f 6f73 6173 322f 622f 7175 696e 7475 732f
3463100  6765 6e65 7269 632f 7170 6c69 6232 2e35 2f6c 6962 7261 7279 2f63 6173 6563 6f6e 7600 7973 003a 2f68 6f6d 652f 6f73 6173
3463160  322f 622f 7175 696e 7475 732f 6765 6e65 7269 632f 7170 6c69 6232 2e35 2f6c 6962 7261 7279 2f63 6173 6563 6f6e 762e 706c
3463240  006c 6573 0000 002c 0017 abd0 b27c b66c 0000 10b3 7fff ffff 0016 4dc4 0200 0db5 0200 2f35 0000 7d27 0000 0403 0000 315f
3463320  0016 5334 0000 002c b288 b66c 0000 10b2 7fff ffff 0016 4f3c 0200 0db5 0100 15ad 0100 33fd 0000 000b 0000 315f 0000 002c
3463400  0017 ac28 b27c b66c 0000 1cd8 7fff ffff 0016 2420 0200 0db5 0200 224d 0000 7d27 0000 7d07 0000 315f 0011 7265 6d6f 7665
3463460  5f6c 7665 725f 6669 6c65 7300 0000 002c 0016 428c b27c b66c 0000 10d9 7fff ffff 0011 773c 0200 0db5 0200 24bd 0000 3287
3463540  0000 7d07 0000 315f 0000 002c 0016 2630 b27c b66c 0000 10b7 7fff ffff 0011 7768 0200 0db5 0200 284d 0000 7d07 0000 7d27
3463620  0000 315f 0000 0034 0016 299c b27c b66c 0000 10b8 7fff ffff 0016 5060 0200 0db5 0400 242d 0000 273f 0000 000b 0000 7d07
3463700  0000 21cf 0000 315f 0000 0034 0016 502c b27c b66c 0000 10b9 7fff ffff 0016 5094 0200 0db5 0400 242d 0000 273f 0000 0013
3463760  0000 7d07 0000 21cf 0000 315f 0000 0034 0016 5060 b27c b66c 0000 10ba 7fff ffff 0016 50c8 0200 0db5 0400 242d 0000 7d2f
3464040  0000 000b 0000 7107 0000 21cf 0000 315f 0000 0034 0016 5094 b27c b66c 0000 10bb 7fff ffff 0016 50fc 0200 0db5 0400 242d
3464120  0000 7d2f 0000 0013 0000 7d07 0000 21cf 0000 315f 0000 0034 0016 50c8 b27c b66c 0000 10bc 7fff ffff 0016 5130 0200 0db5
3464200  0400 242d 0000 3267 0000 000b 0000 7d07 0000 21cf 0000 315f 0000 0034 0016 50fc b27c b66c 0000 10bd 7fff ffff 0016 5164
3464260  0200 0db5 0400 242d 0000 3267 0000 0013 0000 7107 0000 21cf 0000 315f 0000 0034 0016 5130 b27c b66c 0000 10be 7fff ffff
3464340  0011 7794 0200 0db5 0400 242d 0000 7d37 0000 0013 0000 7d07 0000 21cf 0000 315f 0000 0034 0016 2b08 b27c b66c 0000 10bf
3464420  7fff ffff 0016 51cc 0200 0db5 0400 24ad 0000 3e8f 0000 000b 0000 7d07 0000 3e0f 0000 315f 0000 0034 0016 5198 b27c b66c
3464500  0000 10c0 7fff ffff 0016 5200 0200 0db5 0400 24ad 0000 3ee7 0000 000b 0000 7d07 0000 3e0f 0000 315f 0000 0034 0016 51cc
3464560  b27c b66c 0000 10c1 7fff ffff 0016 5234 0200 0db5 0400 24ad 0000 3f2f 0000 000b 0000 7d07 0000 3e0f 0000 315f 0000 0034
3464640  0016 5200 b27c b66c 0000 10c2 7fff ffff 0016 5268 0200 0db5 0400 24ad 0000 3f3f 0000 0013 0000 7407 0000 3e0f 0000 315f
3464720  0000 0034 0016 5234 b27c b66c 0000 10c3 7fff ffff 0016 529c 0200 0db5 0400 24ad 0000 3f47 0000 0013 0000 7d07 0000 3e0f
3465000  0000 315f 0000 0034 0016 5268 b27c b66c 0000 10c4 7fff ffff 0016 52d0 0200 0db5 0400 24ad 0000 6eff 0000 0013 0000 7d07
3465060  0000 6e3f 0000 315f 0000 0034 0016 529c b27c b66c 0000 10c5 7fff ffff 0016 5304 0200 0db5 0400 24ad 0000 6ef7 0000 001b
3465140  0000 7d07 0000 6e3f 0000 315f 0000 0034 0016 52d0 b27c b66c 0000 10c6 7fff ffff 0018 22c8 0200 0db5 0400 24ad 0000 2fdf
3465220  0000 000b 0000 7d07 0000 6e3f 0000 315f 0016 54d0 0000 009c b27c b66c 0000 10c7 0000 10da 0016 539c 0200 0db5 0500 1cdd
3465300  0000 2def 0000 000b 0000 7d07 00bf 6fa3 0000 0403 0000 315f 0016 5398 0000 002c b4f0 b4e4 0000 10c6 7fff ffff 0008 b0dd
3465360  0000 0000 0000 0000 0016 5b20 0002 438a 0017 f4f4 0016 54d0 0000 0038 b27c b66c 0000 10c9 0000 10db 0016 54d4 0200 0db5
3465440  0500 1cdd 0000 7437 0000 0013 0000 7d07 00be 67c3 0000 0403 0000 315f 2c78 00fe 0002 438a 45d0 46ec 9328 98c4 0028 3364
3465520  3bf4 0000 0008 b39c 0020 3380 001c 3aa0 0017 eec4 0020 382c 001c 3788 242c 0000 0008 b39c 2e7c ad64 2ba0 0020 0034 3a4c
3465600  0014 59f4 0020 aa18 2e98 3364 3bf4 0000 0014 5a9c 0020 3380 001c 3aa0 0017 eec4 0020 382c 001c 3788 242c 0000 0014 5a9c
3465660  2c30 000c 9328 9410 aa18 2e98 c5a8 2c30 0030 9314 9860 aa18 2e98 3380 001c 39f8 0008 b39c 0020 382c 001c 32d4 24d0 0000
3465740  0017 eee4 0020 3818 379c 234c 0008 b39c 2c30 0036 3ba0 0000 0014 59f4 0020 aa18 2e98 3380 001c 33f8 0008 b39c 0020 3e70
3466020  001c 32d4 24d0 0000 0017 eee4 001c 3d48 379c 234c 0008 b39c 2c30 000c 9314 9410 aa18 2e98 c5a8 2c58 c5a8 0a09 0016 554c
3466100  0000 0038 b27c b66c 0000 10ca 0000 10dc 0016 5550 0200 0db5 0500 1cdd 0000 7d47 0000 0013 0000 7d07 00bf 7623 0000 0403
3466160  0000 315f 2954 0044 0002 438a 56f8 6854 59b0 5758 6aa0 6a00 2e7c ae74 001c 2ba0 0020 0014 3bf4 0000 000c 4478 0020 aa88
3466240  001c 2e98 c5a8 2c58 3818 3a4c 000c 4418 0014 2330 0017 eec4 0016 55c8 0000 0038 b27c b66c 0000 10cb 0000 10dd 0016 55cc
3466320  0200 0db5 0500 1cdd 0000 7d4f 0000 0013 0000 7407 00bf 7723 0000 0403 0000 315f 2954 0044 0002 438a 56f8 6854 69b0 5758
3466400  6aa0 6a00 2e7c ae74 001c 2ba0 0020 0014 3c48 0000 000c 4358 0020 aa88 001c 2e98 c5a8 2c58 3818 3a4c 000c 44b8 0014 2330
3466460  0017 eee4 0016 5678 0000 0038 b27c b66c 0000 10cc 0000 10de 0016 567c 0200 0db5 0500 1cdd 0000 273f 0000 0013 0000 7d07
3466540  00be 61c3 0000 0403 0000 315f 2c78 0078 0002 438a 45b8 46ec 9300 98c4 0024 3364 3b4c 0000 0008 b39c 0020 3348 3c48 0000
3466620  0017 eff0 0020 333c 3788 234c 0008 b39c 2e7c ae74 001c 2ba0 0020 0032 3b4c 0000 0014 59f4 0020 aa88 001c 2e98 3364 39a4
3466700  0014 5a9c 001c 3348 4108 0000 0017 eff0 0018 333c 3788 234c 0014 5a9c 2c58 2330 0017 eff0 0016 5760 0000 0070 b27c b66c
3466760  0000 10cd 0000 10df 0016 56b4 0200 0db5 0500 1cdd 0000 7d57 0000 0013 0000 7d07 00bf 7f83 0000 0403 0000 315f 0016 5760
3467040  0000 0038 b27c b66c 0000 10ce 0000 10e0 0016 5764 0200 0db5 0500 1cdd 0000 3267 0000 0013 0000 7d07 00be 66c3 0000 0403
3467120  0000 315f 2c78 0078 0002 438a 45b8 46ec 9300 98c4 0024 3364 3b4c 0000 0008 b39c 0020 3348 3c48 0000 0017 f0ac 0020 3d3c
3467200  3788 234c 0008 b39c 2e7c ae74 001c 2ba0 0020 0032 3b4c 0000 0014 59f4 0020 aa88 001c 2e98 3364 39a4 0014 5a9c 001c 3348
```

```
3467260 4108 0000 0017 f0ac 0018 3d3c 3788 234c 0014 5a9c 2c58 2330 0017 f0ac 0016 5898 0000 00b0 b27c b66c 0000 10cf 0000 10e1
3467340 0016 579c 0200 0db5 0500 1cdd 0000 7d5f 0000 0013 0000 7d07 00bf 8563 0000 0403 0000 315f 0016 57d0 0000 0038 b27c b66c
3467420 0000 10d0 0000 10e2 0016 589c 0200 0db5 0500 1cdd 0000 7d2f 0000 0013 0000 7d07 00be 6443 0000 0403 0000 315f 0016 5898
3467500 0000 0040 0000 0000 0000 0000 0000 0000 0017 f164 0000 0000 0017 efb0 0000 0000 0017 ef4c 0017 ef04 0017 f0bc 0017 f18d
3467560 0017 f248 0000 0000 0000 0000 2c78 0088 0002 438a 45b8 46ec 9300 98c4 0028 3364 3b4c 0000 0008 b39c 0020 41fc 0000 0003
3467640 3348 3aa0 0017 efd0 0020 3d3c 3788 234c 0008 b39c 2e7c ae74 001c 2ba0 0020 0036 3b4c 0000 0014 59f4 0020 aa88 001c 2e98
3467720 3364 39a4 0014 5a9c 001c 41fc 0000 0003 3348 40a0 0017 efd0 0018 3d3c 3788 234c 0014 5a9c 2c58 41fc 0000 0003 2410 0000
3470000 0017 efd0 0016 5928 0000 0038 b27c b66c 0000 10d1 0000 10e3 0016 592c 0200 0db5 0500 1cdd 0000 7d67 0000 001b 0000 7d07
3470060 00bf 7e83 0000 0403 0000 315f 28c4 0058 0017 f1f8 56f8 6854 69b0 5758 6aa0 6a00 4790 001c 3bf4 0000 000c 41b8 0020 2ecc
3470140 aa88 001c aab4 0000 a1d0 0010 3818 3a4c 000c 4418 001c 2c88 000e 3818 3bf4 0000 000c 44b8 0014 41fc 0000 000b 2410 0000
3470220 0017 efd0 0016 59cc 0000 0038 b27c b66c 0000 10d2 0000 10e4 0016 59d0 0200 0db5 0500 1cdd 0000 273f 0000 000b 0000 7d07
3470300 00bd 5c23 0000 0403 0000 315f 27f0 003c 0016 5998 35c8 2520 92a8 97ac 3050 2e7c ad64 2ba0 0014 001e 33bc 31f0 24d0 0000
3470360 0014 5a64 0014 4078 000c 4478 0010 aa18 2e98 c5a8 2c58 723c 2954 0030 0002 438a 2520 2e7c ad64 2ba0 0014 001a 332c 247c
3470440 0017 f238 0014 4078 000c 4478 0010 aa18 2e98 c5a8 2c58 723c 0016 5a70 0000 0038 b27c b66c 0000 10d3 0000 10e5 0016 5a74
3470520 0200 0db5 0500 1cdd 0000 3267 0000 000b 0000 7d07 00be 6543 0000 0403 0000 315f 27f0 003c 0016 5a3c 35c8 2520 92a8 97ac
3470600 3050 2e7c ad64 2ba0 0014 001e 33bc 31f0 24d0 0000 0014 5a64 0014 4078 000c 4358 0010 aa18 2e98 c5a8 2c58 723c 2954 0030
3470660 0002 438a 2520 2e7c ad64 2ba0 0014 001a 332c 247c 0017 f238 0014 4078 000c 4358 0010 aa18 2e98 c5a8 2c58 723c 0016 5b1c
3470740 0000 0038 b27c b66c 0000 10d4 0000 10e6 0016 5b20 0200 0db5 0500 1cdd 0000 7d2f 0000 000b 0000 7d07 00be 62c3 0000 0403
3471020 0000 315f 27f0 0040 0016 5ae4 45c4 9314 97ac 3050 33d8 37f0 31f0 247c 0014 5a64 0018 408c 000c 4358 0014 2ecc 33a0 37f0
3471100 31f0 247c 0014 5a64 0010 4064 000c 4478 000c 2eb0 2954 0034 0002 438a 45c4 3348 3ba0 0000 0017 f238 0018 408c 000c 4358
3471160 0014 2ecc 3310 39f8 0017 f238 0010 4064 000c 4478 000c 2eb0 0016 6cb8 0000 118c b130 b66c 0000 10d5 0000 10e7 0016 5371
3471240 0200 0db5 0500 1cdd 0000 7d6f 0000 0013 0000 7d07 00bf 91c3 0000 0403 0000 315f 0016 6cb8 0000 1154 6c65 292e 0a09 0a2a
3471320 2f0a 0a25 2525 2525 2525 2525 2525 2525 2525 2525 2525 2525 2525 2525 2525 2525 2525 2525 2525 2525 2525 2525 2525 2525
3471400 2525 2525 2525 2525 2525 2525 2525 2525 2525 2525 2525 2525 2525 2525 2525 250a 7265 6d6f 7665 5f66 696c 6573 2846
3471460 696c 6573 2920 3a2d 0a09 6973 5f6c 6973 7428 4669 6c65 7329 2c21 2c0a 0963 6f6e 6361 745f 6174 6f6d 2846 696c 6573 2c20
3471540 2720 272c 2043 6f6d 6269 6e65 6446 696c 6573 292c 0a09 7379 7374 656d 285b 272f 6269 6e2f 726d 202d 6620 272c 2043 6f6d
3471620 6269 6e65 6446 696c 6573 5d29 2e0a 7265 6d6f 7665 5f66 696c 6573 2846 696c 6529 203a 2d0a 0973 7973 7465 6d28 5b27 6269
3471700 6e2f 726d 202d 6620 272c 2046 696c 655d 292e 0a25 2525 2525 2525 2525 2525 2525 2525 2525 2525 2525 2525 2525 2525 2525
3471760 2525 2525 2525 2525 2525 2525 2525 2525 2525 2525 2525 2525 2525 2525 2525 2525 2525 2525 2525 2525 2525 2525 2525 2525
3472040 250a 0007 0016 5c76 0200 0ddf 0000 0007 0016 5c4e 0200 0ddf 0000 0007 0016 5c26 0200 0ddf 0000 0007 0016 5bfe 0200 0ddf
3472120 0000 0007 0016 5bd6 0200 0ddf 0000 0007 0016 5bae 0200 0ddf 0000 0007 0016 5b86 0200 0ddf 0000 0007 0016 5b5e 0200 0ddf
3472200 0000 0007 0016 5b36 0200 0ddf 0016 5a6a 0000 0007 0014 479d 0016 5d2e 0014 4821 0016 5d36 0014 4865 0016 5d46 0014 48a5
3472260 0016 5d4e 0014 48e9 0000 0007 0014 4929 0016 5d56 0014 496d 0016 5d5e 0014 49f1 0000 0007 0200 0ddf 0016 5d26 0000 0007
3472340 0200 0ddf 0016 5d3e 0000 0007 0016 5d65 0000 0007 0016 5d71 0000 0007 0200 0ddf 0000 0007 0016 5d7e 0200 0ddf 0000 0007
3472420 0016 5d86 0016 5d8d 0000 0007 0016 5d99 0000 0007 0200 0ddf 0000 0007 0016 5da6 0200 0ddf 0000 0007 0016 5dae 0016 5db5
3472500 0000 0007 0016 5dc1 0000 0007 0200 0ddf 0000 0007 0016 5dce 0200 0ddf 0000 0007 0016 5dd6 0016 5ddd 0000 0007 0016 5de9
3472560 0000 0007 0200 0ddf 0000 0007 0016 5df6 0200 0ddf 0000 0007 0016 5dfe 0016 5e05 0000 0007 0016 5e11 0000 0007 0200 0ddf
3472640 0000 0007 0016 5e1e 0200 0ddf 0000 0007 0016 5e26 0016 5e2d 0000 0007 0016 5e39 0000 0007 0200 0ddf 0000 0007 0016 5e46
3472720 0200 0ddf 0000 0007 0016 5e4e 0016 5e55 0000 0007 0016 5e61 0000 0007 0200 0ddf 0000 0007 0016 5e6e 0200 0ddf 0000 0007
3473000 0016 5e76 0016 5e7d 0000 0007 0016 5e89 0000 0007 0200 0ddf 0000 0007 0016 5e96 0200 0ddf 0000 0007 0016 5e9e 0016 5ea5
3473060 0000 0007 0016 5eb1 0000 0007 0200 0ddf 0000 0007 0016 5ebe 0200 0ddf 0000 0007 0016 5ec6 0016 5ecd 0000 0007 0016 5ed9
3473140 0000 0007 0200 0ddf 0000 0007 0016 5ebe 0200 0ddf 0000 0007 0016 5e96 0200 0ddf 0000 0007 0016 5e6e 0200 0ddf 0000 0007
3473220 0016 5e46 0200 0ddf 0000 0007 0016 5e1e 0200 0ddf 0000 0007 0016 5df6 0200 0ddf 0000 0007 0016 5dce 0200 0ddf 0000 0007
3473300 0016 5da6 0200 0ddf 0000 0007 0016 5d7e 0200 0ddf 0016 5d26 0000 0007 0014 479d 0016 5f7e 0014 4821 0016 5f86 0014 4865
3473360 0000 0007 0014 48e9 0000 0007 0200 0ddf 0016 5f6e 0000 0007 0200 0ddf 0016 5f76 0000 0007 0016 5f8d 0000 0007 0016 5f99
3473440 0000 0007 0200 0ddf 0000 0007 0016 5fa6 0200 0ddf 0000 0007 0016 5fae 0016 5fb5 0000 0007 0016 5fc1 0000 0007 0200 0ddf
3473520 0000 0007 0016 5fce 0200 0ddf 0000 0007 0016 5fd6 0016 5fdd 0000 0007 0016 5fe9 0000 0007 0200 0ddf 0000 0007 0016 5ff6
3473600 0200 0ddf 0000 0007 0016 5ffe 0016 6005 0000 0007 0016 6011 0000 0007 0200 0ddf 0000 0007 0016 601e 0200 0ddf 0000 0007
3473660 0016 6026 0016 602d 0000 0007 0016 6039 0000 0007 0200 0ddf 0000 0007 0016 6046 0200 0ddf 0000 0007 0016 604e 0016 6055
3473740 0000 0007 0016 6061 0000 0007 0200 0ddf 0000 0007 0016 606e 0200 0ddf 0000 0007 0016 6076 0016 607d 0000 0007 0016 6089
3474020 0000 0007 0200 0ddf 0000 0007 0016 6096 0200 0ddf 0000 0007 0016 609e 0016 60a5 0000 0007 0016 60b1 0000 0007 0200 0ddf
3474100 0000 0007 0016 60be 0200 0ddf 0000 0007 0016 60c6 0016 60cd 0000 0007 0016 60d9 0000 0007 0200 0ddf 0000 0007 0016 60e6
3474160 0200 0ddf 0000 0007 0016 60ee 0016 60f5 0000 0007 0016 6101 0000 0007 0600 32df 0000 0673 0014 8984 0014 8988 0013 9ec9
3474240 0014 4789 0014 8994 0300 2a87 0013 9ee0 0016 611d 0013 9ee8 0200 0df7 0016 612c 0016 6139 0200 0ad7 0016 6130 0016 6149
3474320 0300 2a87 0013 9e98 0014 897d 0013 9ea0 0200 0df7 0000 3387 0016 6161 0200 0ad7 0016 6134 0016 6171 0000 22cf 0600 32df
```

```
3474400  0000 067b 0014 89b0 0014 89b4 0013 9e39 0014 480d 0014 89c0 0300 2a87 0013 9e50 0016 618d 0013 9e58 0200 0df7 0016 619c
3474460  0016 61a9 0200 0ad7 0016 61a0 0016 61b9 0300 2a87 0013 9e08 0014 89a9 0013 9e10 0200 0df7 0000 3387 0016 61d1 0200 0ad7
3474540  0016 61a4 0016 61e1 0000 22cf 0200 0ddf 0000 0007 0016 5ec6 0200 0ddf 0000 0007 0016 5e9e 0200 0ddf 0000 0007 0016 5e76
3474620  0200 0ddf 0000 0007 0016 5e4e 0200 0ddf 0000 0007 0016 5e26 0200 0ddf 0000 0007 0016 5dfe 0200 0ddf 0000 0007 0016 5dd6
3474700  0200 0ddf 0000 0007 0016 5dae 0200 0ddf 0000 0007 0016 5d86 0200 0ddf 0016 5d3e 0000 0007 0014 48a5 0016 6286 0014 4929
3474760  0016 628e 0014 496d 0000 0007 0014 49f1 0000 0007 0200 0ddf 0016 6276 0000 0007 0200 0ddf 0016 627e 0000 0007 0016 6295
3475040  0000 0007 0016 62a1 0000 0007 0200 0ddf 0000 0007 0016 62ae 0200 0ddf 0000 0007 0016 62b6 0016 62bd 0000 0007 0016 62c9
3475120  0000 0007 0200 0ddf 0000 0007 0016 62d6 0200 0ddf 0000 0007 0016 62de 0016 62e5 0000 0007 0016 62f1 0000 0007 0200 0ddf
3475200  0000 0007 0016 62fe 0200 0ddf 0000 0007 0016 6306 0016 630d 0000 0007 0016 6319 0000 0007 0200 0ddf 0000 0007 0016 6326
3475260  0200 0ddf 0000 0007 0016 632e 0016 6335 0000 0007 0016 6341 0000 0007 0200 0ddf 0000 0007 0016 634e 0200 0ddf 0000 0007
3475340  0016 6356 0016 635d 0000 0007 0016 6369 0000 0007 0200 0ddf 0000 0007 0016 6376 0200 0ddf 0000 0007 0016 637e 0016 6385
3475420  0000 0007 0016 6391 0000 0007 0200 0ddf 0000 0007 0016 639e 0200 0ddf 0000 0007 0016 63a6 0016 63ad 0000 0007 0016 63b9
3475500  0000 0007 0200 0ddf 0000 0007 0016 63c6 0200 0ddf 0000 0007 0016 63ce 0016 63d5 0000 0007 0016 63e1 0000 0007 0200 0ddf
3475560  0000 0007 0016 63ee 0200 0ddf 0000 0007 0016 63f6 0016 63fd 0000 0007 0016 6409 0000 0007 0600 32df 0000 0683 0014 89dc
3475640  0014 89e0 0013 9da9 0014 4891 0014 89ec 0300 2a87 0013 9dc0 0016 6425 0013 9dc8 0200 0df7 0016 6434 0016 6441 0200 0ad7
3475720  0016 6438 0016 6451 0300 2a87 0013 9d78 0014 89d5 0013 9d80 0200 0df7 0000 3387 0016 6469 0200 0ad7 0016 643c 0016 6479
3476000  0000 22cf 0600 32df 0000 068b 0014 8a08 0014 8a0c 0013 9d19 0014 4915 0014 8a18 0300 2a87 0013 9d30 0016 6495 0013 9d38
3476060  0200 0df7 0016 64a4 0016 64b1 0200 0ad7 0016 64a8 0016 64c1 0300 2a87 0013 9ce8 0014 8a01 0013 9cf0 0200 0df7 0000 3387
3476140  0016 64d9 0200 0ad7 0016 64ac 0016 64e9 0000 22cf 0200 0ddf 0000 0007 0016 5c7e 0200 0ddf 0000 0007 0016 5c56 0200 0ddf
3476220  0000 0007 0016 5c2e 0200 0ddf 0000 0007 0016 5c06 0200 0ddf 0000 0007 0016 5bde 0200 0ddf 0000 0007 0016 5bb6 0200 0ddf
3476300  0000 0007 0016 5b8e 0200 0ddf 0000 0007 0016 5b66 0200 0ddf 0000 0007 0016 5b3e 0200 0ddf 0016 5aa2 0016 5b16 0014 49ad
3476360  0016 6586 0014 4a31 0016 658e 0014 4a75 0016 6596 0014 4af9 0000 0007 0200 0ddf 0016 5ad6 0000 0007 0014 4c55 0016 65b2
3476440  0014 4cd9 0016 65ba 0014 411d 0016 65c2 0014 4da1 0000 0007 0200 0ddf 0000 0007 0000 0007 0200 0ddf 0016 65aa 0000 0007
3476520  0000 0007 0000 0007 0016 65d5 0000 0007 0200 0ddf 0016 657e 0000 0007 0200 0ddf 0000 0007 0016 65ea 0016 65f1 0000 0007
3476600  0016 65fd 0000 0007 0200 0ddf 0000 0007 0016 660a 0200 0ddf 0000 0007 0016 6612 0016 6619 0000 0007 0016 6625 0000 0007
3476660  0200 0ddf 0000 0007 0016 6632 0200 0ddf 0000 0007 0016 663a 0016 6641 0000 0007 0016 664d 0000 0007 0200 0ddf 0000 0007
3476740  0016 665a 0200 0ddf 0000 0007 0016 6662 0016 6669 0000 0007 0016 6675 0000 0007 0200 0ddf 0000 0007 0016 6682 0200 0ddf
3477020  0000 0007 0016 668a 0016 6691 0000 0007 0016 669d 0000 0007 0200 0ddf 0000 0007 0016 66aa 0200 0ddf 0000 0007 0016 66b2
3477100  0016 66b9 0000 0007 0016 66c5 0000 0007 0200 0ddf 0000 0007 0016 66d2 0200 0ddf 0000 0007 0016 66da 0016 66e1 0000 0007
3477160  0016 66ed 0000 0007 0200 0ddf 0000 0007 0016 66fa 0200 0ddf 0000 0007 0016 6702 0016 6709 0000 0007 0016 6715 0000 0007
3477240  0200 0ddf 0000 0007 0016 6722 0200 0ddf 0000 0007 0016 672a 0016 6731 0000 0007 0016 673d 0000 0007 0200 0ddf 0000 0007
3477320  0016 674a 0200 0ddf 0000 0007 0016 6752 0016 6759 0000 0007 0016 6765 0000 0007 0200 0ddf 0000 0007 0016 674a 0200 0ddf
3477400  0000 0007 0016 6722 0200 0ddf 0000 0007 0016 66fa 0200 0ddf 0000 0007 0016 66d2 0200 0ddf 0000 0007 0016 66aa 0200 0ddf
3477460  0000 0007 0016 6682 0200 0ddf 0000 0007 0016 665a 0200 0ddf 0000 0007 0016 6632 0200 0ddf 0000 0007 0016 660a 0200 0ddf
3477540  0016 657e 0000 0007 0014 49ad 0016 680a 0014 4a31 0016 6812 0014 4a75 0000 0007 0014 4af9 0000 0007 0200 0ddf 0016 67fa
3477620  0000 0007 0200 0ddf 0016 6802 0000 0007 0016 6819 0000 0007 0016 6825 0000 0007 0200 0ddf 0000 0007 0016 6832 0200 0ddf
3477700  0000 0007 0016 683a 0016 6841 0000 0007 0016 684d 0000 0007 0200 0ddf 0000 0007 0016 685a 0200 0ddf 0000 0007 0016 6862
3477760  0016 6869 0000 0007 0016 6875 0000 0007 0200 0ddf 0000 0007 0016 6882 0200 0ddf 0000 0007 0016 688a 0016 6891 0000 0007
3500040  0016 689d 0000 0007 0200 0ddf 0000 0007 0016 68aa 0200 0ddf 0000 0007 0016 68b2 0016 68b9 0000 0007 0016 68c5 0000 0007
3500120  0200 0ddf 0000 0007 0016 68d2 0200 0ddf 0000 0007 0016 68da 0016 68e1 0000 0007 0016 68ed 0000 0007 0200 0ddf 0000 0007
3500200  0016 68fa 0200 0ddf 0000 0007 0016 6902 0016 6909 0000 0007 0016 6915 0000 0007 0200 0ddf 0000 0007 0016 6922 0200 0ddf
3500260  0000 0007 0016 692a 0016 6931 0000 0007 0016 693d 0000 0007 0200 0ddf 0000 0007 0016 694a 0200 0ddf 0000 0007 0016 6952
3500340  0016 6959 0000 0007 0016 6965 0000 0007 0200 0ddf 0000 0007 0016 6972 0200 0ddf 0000 0007 0016 697a 0016 6981 0000 0007
3500420  0016 698d 0000 0007 0600 32df 0000 0693 0014 8a34 0014 8a38 0013 9c89 0014 4999 0014 8a44 0300 2a87 0013 9ca0 0016 69a9
3500500  0013 9ca8 0200 0df7 0016 69b8 0016 69c5 0200 0ad7 0016 69bc 0016 69d5 0300 2a87 0013 9c58 0014 8a2d 0013 9c60 0200 0df7
3500560  0000 3387 0016 69ed 0200 0ad7 0016 69c0 0016 69fd 0000 22cf 0600 32df 0000 069b 0014 8a60 0014 8a64 0013 9bf9 0014 4a1d
3500640  0014 8a70 0300 2a87 0013 9c10 0016 6a19 0013 9c18 0200 0df7 0016 6a28 0016 6a35 0200 0ad7 0016 6a2c 0016 6a45 0300 2a87
3500720  0013 9bc8 0014 8a59 0013 9bd0 0200 0df7 0000 3387 0016 6a5d 0200 0ad7 0016 6a30 0016 6a6d 0000 22cf 0200 0ddf 0000 0007
3501000  0016 6752 0200 0ddf 0000 0007 0016 672a 0200 0ddf 0000 0007 0016 6702 0200 0ddf 0000 0007 0016 661a 0200 0ddf 0000 0007
3501060  0016 66b2 0200 0ddf 0000 0007 0016 668a 0200 0ddf 0000 0007 0016 6662 0200 0ddf 0000 0007 0016 663a 0200 0ddf 0000 0007
3501140  0016 6612 0200 0ddf 0000 0007 0016 65ea 0200 0ddf 0016 65aa 0000 0007 0014 4c55 0016 6b1e 0014 4cd9 0016 6b26 0014 4d1d
3501220  0000 0007 0014 4da1 0000 0007 0200 0ddf 0016 6b0e 0000 0007 0200 0ddf 0016 6b16 0000 0007 0016 6b2d 0000 0007 0016 6b39
3501300  0000 0007 0200 0ddf 0000 0007 0016 6b46 0200 0ddf 0000 0007 0016 6b4e 0016 6b55 0000 0007 0016 6b61 0000 0007 0200 0ddf
3501360  0000 0007 0016 6b6e 0200 0ddf 0000 0007 0016 6b76 0016 6b7d 0000 0007 0016 6b89 0000 0007 0200 0ddf 0000 0007 0016 6b96
3501440  0200 0ddf 0000 0007 0016 6b9e 0016 6ba5 0000 0007 0016 6bb1 0000 0007 0200 0ddf 0000 0007 0016 6bbe 0200 0ddf 0000 0007
```

```
3501520 0016 6bc6 0016 6bcd 0000 0007 0016 6bd9 0000 0007 0200 0ddf 0000 0007 0016 6be6 0200 0ddf 0000 0007 0016 6bee 0016 6bf5
3501600 0000 0007 0016 6c01 0000 0007 0200 0ddf 0000 0007 0016 6c0e 0200 0ddf 0000 0007 0016 6c16 0016 6c1d 0000 0007 0016 6c29
3501660 0000 0007 0200 0ddf 0000 0007 0016 6c36 0200 0ddf 0000 0007 0016 6c3e 0016 6c45 0000 0007 0016 6c51 0000 0007 0200 0ddf
3501740 0000 0007 0016 6c5e 0200 0ddf 0000 0007 0016 6c66 0016 6c6d 0000 0007 0016 6c79 0000 0007 0200 0ddf 0000 0007 0016 6c86
3502020 0200 0ddf 0016 482c 0017 a5e4 000a 4238 0000 0000 0016 6dc0 0000 0058 b288 b66c 0000 1072 7fff ffff 0017 7f4c 0200 0db5
3502100 0100 15ad 0100 33fd 0000 000b 0000 315f 0016 64c0 0000 002c b288 b66c 0000 1072 7fff ffff 0016 6cbc 0200 0db5 0100 15ad
3502160 0100 33fd 0000 000b 0000 315f 003b 2f68 6f6d 652f 6f73 6173 312f 612f 7669 6a61 792f 5648 444c 2f70 6172 7365 722f 7072
3502240 6f6c 6f67 2f6e 6577 6e65 772f 7633 2e31 2f72 6561 6466 696c 6500 742c 003e 2f68 6f6d 652f 6f73 6173 312f 612f 7669 6a61
3502320 792f 5648 444c 2f70 6172 7365 722f 7072 6f6c 6f67 2f6e 6577 6e65 772f 7633 2e31 2f72 6561 6466 696c 652e 706c 0065 292c
3502400 0000 002c 0016 43c4 b27c b66c 0000 1075 7fff ffff 0016 256c 0200 0db5 0200 2f35 0000 7a17 0000 03f3 0000 315f 0016 6e2c
3502460 0000 002c b288 b66c 0000 1074 7fff ffff 0016 6498 0200 0db5 0100 15ad 0100 33fd 0000 000b 0000 315f 0000 002c 0016 2420
3502540 b27c b66c 0000 1086 7fff ffff 0016 4258 0200 0db5 0200 224d 0000 7a17 0000 3287 0000 315f 2938 0014 0016 90cc 4e1c 0000
3502620 0000 0007 3050 c5a8 0016 6ef0 0000 0090 b27c b66c 0000 1077 0000 1085 000a d16d 0200 0db5 0200 270d 0000 7a17 0000 3287
3502700 0000 315f 0016 6e90 0000 0038 b27c b66c 0000 1078 0000 1087 0016 6ef4 0200 0db5 0500 1cdd 0000 71d7 0000 000b 0000 3287
3502760 00ad 5ae3 0000 03f3 0000 315f 0016 6ef0 0000 002c b4f0 b4e4 0000 1077 7fff ffff 0008 b0dd 0000 0000 0000 0000 0016 7728
3503040 0002 438a 0016 bd64 2c78 0034 0002 439a 45b8 4550 6d0c 5370 4538 4af8 0000 7a1f 6bb4 247c 0015 3d5c 0010 37dc 4240 0000
3503120 0000 6d0f 242c 0000 0017 9f5c 0016 700c 0000 00e0 b27c b66c 0000 1079 0000 1088 0016 6f2c 0200 0db5 0500 1cdd 0000 7a2f
3503200 0000 000b 0000 3287 00bc fca3 0000 03f3 0000 315f 0016 6f60 0000 0038 b27c b66c 0000 107a 0000 1089 0016 6f64 0200 0db5
3503260 0500 1cdd 0000 77ff 0000 000b 0000 3287 00b2 6443 0000 03f3 0000 315f 0016 6f98 0000 0038 b27c b66c 0000 107b 0000 108a
3503340 0016 6f9c 0200 0db5 0500 1cdd 0000 7a37 0000 000b 0000 3287 00bc ff23 0000 03f3 0000 315f 0016 700c 0000 0038 b27c b66c
3503420 0000 107c 0000 108b 0016 7010 0200 0db5 0500 1cdd 0000 7a27 0000 0013 0000 3287 00bc fae3 0000 03f3 0000 315f 2c78 003c
3503500 0002 438a 45c4 3574 33a0 41e8 0000 2ccf 24d0 0000 0008 d3dc 0014 2ba0 0014 0010 37dc 39f8 0017 a03c 0010 2c88 0004 2c58
3503560 3cf4 234c 0008 b95c 0016 7074 0000 0038 b27c b66c 0000 107d 0000 108c 0016 7078 0200 0db5 0500 1cdd 0000 7a47 0000 0013
3503640 0000 3287 00bd 01e3 0000 03f3 0000 315f 2c78 0030 0002 438a 45b8 4700 24d0 0000 0008 dadc 0018 33bc 3804 39a4 0017 a05c
3503720 0014 3d60 320c 39a4 0017 a07c 000c 2eb0 0016 70e0 0000 0038 b27c b66c 0000 107e 0000 108d 0016 70e4 0200 0db5 0500 1cdd
3504000 0000 7a4f 0000 001b 0000 3287 00bd 02e3 0000 03f3 0000 315f 2c78 0034 0002 438a 45d0 46d8 4754 3364 3b4c 0000 0010 ab6c
3504060 001c 3858 3d48 3a4c 0017 a0ac 0014 37f0 3b4c 0000 0017 a0cc 000c 2eb0 0016 7560 0000 00b0 b27c b66c 0000 107f 0000 108e
3504140 0016 711c 0200 0db5 0500 1cdd 0000 7a67 0000 0013 0000 3287 00bd 0663 0000 03f3 0000 315f 0016 7150 0000 0038 b27c b66c
3504220 0000 1080 0000 108f 0016 7564 0200 0db5 0500 1cdd 0000 7a5f 0000 001b 0000 3287 00bd 0563 0000 03f3 0000 315f 0016 7560
3504300 0000 0040 0000 0000 0000 0000 0016 b218 0000 0000 0000 0000 0000 0000 0016 b190 0017 a08c 0017 a374 0017 a110 0017 a0dc
3504360 0000 0000 0000 0000 0000 0000 27f0 0030 0017 a120 3574 54f8 2520 4568 4b8c 0000 0000 2147 5370 4550 4b8c 0000 0000 52af
3504440 6bf4 247c 000c 4138 000c 2eb0 2938 0048 0016 7204 4e1c 0000 0000 6d0f 4e70 0000 0000 7a77 57b8 4af8 0000 7a77 55f0 4af8
3504520 0000 52c7 55f0 4af8 0000 3d5f 55f0 5fa0 55f0 5fa0 55f0 5fa0 55f0 5fa0 55f0 5fa0 5370 2edc 28c4 0030 0016 7234 4e1c 0000
3504600 0000 780f 4e70 0000 0000 7a7f 57b8 4af8 0000 7a7f 55f0 4af8 0000 7a87 55f0 5fa0 5370 2edc 28c4 0030 0016 7264 4e1c 0000
3504660 0000 780f 4e70 0000 0000 7a8f 57b8 4af8 0000 7a8f 55f0 4af8 0000 7a87 55f0 5fa0 5370 2edc 28c4 0030 0016 729c 4e1c 0000
3504740 0000 780f 4e70 0000 0000 7a97 57b8 4af8 0000 7a97 55f0 4af8 0000 7a9f 55f0 4af8 0000 7a87 55f0 5fa0 5370 2edc 28c4 0030
3505020 0017 a198 4e1c 0000 0000 780f 4e70 0000 0000 7aa7 57b8 4af8 0000 7aa7 55f0 4af8 0000 7a87 55f0 5fa0 5370 2edc 28c4 0030
3505100 0016 72fc 4e1c 0000 0000 780f 4e70 0000 0000 7abf 57b8 4af8 0000 7abf 55f0 4af8 0000 0daf 55f0 5fa0 5370 2edc 28c4 0030
3505160 0017 a1f8 4e1c 0000 0000 780f 4e70 0000 0000 7677 57b8 4af8 0000 7677 55f0 4af8 0000 0daf 55f0 5fa0 5370 2edc 28c4 0030
3505240 0016 735c 4e1c 0000 0000 779f 4e70 0000 0000 7ad7 57b8 4af8 0000 7ad7 55f0 4af8 0000 7adf 55f0 5fa0 5370 2edc 28c4 0030
3505320 0017 a2a8 4e1c 0000 0000 779f 4e70 0000 0000 7ae7 57b8 4af8 0000 7ae7 55f0 4af8 0000 7aef 55f0 5fa0 5370 2edc 28c4 0030
3505400 0016 73bc 4e1c 0000 0000 7a3f 4e70 0000 0000 7aff 57b8 4af8 0000 7aff 55f0 4af8 0000 7b07 55f0 5fa0 5370 228c 28c4 0040
3505460 0016 73fc 4e1c 0000 0000 7a3f 4e70 0000 0000 7b0f 57b8 4af8 0000 7b0f 55f0 4af8 0000 7b17 55f0 4af8 0000 7b1f 55f0 4af8
3505540 0000 7b27 55f0 5fa0 5370 228c 28c4 0040 0016 743c 4e1c 0000 0000 7a3f 4e70 0000 0000 7b2f 57b8 4af8 0000 7b2f 55f0 4af8
3505620 0000 7b17 55f0 4af8 0000 7b1f 55f0 4af8 0000 7b27 55f0 5fa0 5370 228c 28c4 004c 0016 7488 4e1c 0000 0000 7a3f 4e70 0000
3505700 0000 7b37 57b8 4af8 0000 7b37 55f0 4af8 0000 7b17 55f0 4af8 0000 7b3f 55f0 4af8 0000 7b47 55f0 4af8 0000 7b4f 55f0 5fa0
3505760 55f0 5fa0 5370 228c 28c4 004c 0016 74d4 4e1c 0000 0000 7a3f 4e70 0000 0000 7b57 57b8 4af8 0000 7b57 55f0 4af8 0000 7b17
3506040 55f0 4af8 0000 7b3f 55f0 4af8 0000 7b47 55f0 4af8 0000 7b4f 55f0 5fa0 55f0 5fa0 5370 228c 28c4 0054 0016 7528 4e1c 0000
3506120 0000 7a3f 4e70 0000 0000 7b5f 57b8 4af8 0000 7b5f 55f0 4af8 0000 7b67 55f0 4af8 0000 7b6f 55f0 4af8 0000 7b77 55f0 4af8
3506200 0000 7b47 55f0 4af8 0000 7b7f 55f0 5fa0 55f0 5fa0 5370 228c 28c4 0034 0017 a360 4e1c 0000 0000 7a3f 4e70 0000 0000 7b47
3506260 57b8 4af8 0000 7b47 55f0 4af8 0000 7b7f 55f0 5fa0 55f0 5fa0 5370 228c 0016 76b4 0000 0038 b27c b66c 0000 1081 0000 1090
3506340 0016 76b8 0200 0db5 0500 1cdd 0000 7a57 0000 001b 0000 3287 00bd 03e3 0000 03f3 0000 315f 27f0 0046 0016 75dc 4e1c 0000
3506420 0000 6d0f 36b8 2520 33d8 332c 3280 247c 0017 a31c 0018 4550 6d94 5370 4538 6d50 6bb4 4550 6d0c 6b74 4300 0000 0000 71e7
3506500 0011 ffa0 000c 2ecc c5a8 616e 28c4 0042 0016 7620 4e1c 0000 0000 780f 36b8 2520 33bc 3310 4300 0000 0000 780f 0017 a41c
3506560 0014 4538 6d50 5370 4550 6d0c 6b74 42ac 0000 7b97 0011 ffa0 000c 2ecc c5a8 6f6c 28c4 0046 0016 7668 4e1c 0000 0000 779f
```

```
3506640  36b8 2520 33bc 3310 4300 0000 0000 779f 0017 a41c 0014 9314 9974 4538 6d50 5370 4550 6d0c 6b74 42ac 0000 7b9f 0011 ffa0
3506720  900c 2ecc c5a8 7365 2954 0046 0002 438a 4e1c c000 0000 7a3f 36b8 2520 33bc 3310 4300 0000 0000 7a3f 0017 a41c 0014 9314
3507000  9974 4538 6d50 5370 4550 6d0c 6b74 42ac 0000 7ba7 c011 ffa0 900c 2ecc c5a8 2050 0016 7724 0000 0038 b27c b66c 0000 1082
3507060  0000 1091 0016 7728 0200 0db5 0500 1cdd 0000 7b87 0000 0023 0000 3287 00bd 00e3 0000 03f3 0000 315f 2c78 0038 0002 438a
3507140  5818 4af8 0000 7a77 55f0 4af8 0000 52c7 55f0 4af8 0030 3d5f 55f0 6b48 55f0 6bc8 55f0 5fa0 55f0 6b88 55f0 5fa0 5370 228c
3507220  0016 7a60 0000 0038 b130 b66c 0000 1083 0000 1092 c016 6e95 0200 0db5 0500 1cdd 0000 7b8f 0000 0023 0000 3287 00bd 20e3
3507300  0000 03f3 0000 315f 27f0 0030 0016 7788 4e1c 0000 0000 780f 4e70 0000 0000 7baf 5818 4af8 0000 7a7f 55f0 4af8 0000 7a87
3507360  55f0 6bc8 5370 228c 28c4 0030 0016 77b8 4e1c 0000 0000 780f 4e70 0000 0000 7bb7 5818 4af8 0000 7a8f 55f0 4af8 0000 7a87
3507440  55f0 6bc8 5370 228c 28c4 0038 0016 77f0 4e1c 0000 0000 780f 4e70 0000 0000 7bbf 5818 4af8 0000 7a97 55f0 4af8 0000 7a9f
3507520  55f0 4af8 0000 7a87 55f0 6bc8 5370 228c 28c4 0030 0017 a530 4e1c 0000 0000 780f 4e70 0000 0000 7bc7 5818 4af8 0000 7aa7
3507600  55f0 4af8 0000 7a87 55f0 6bc8 5370 228c 28c4 0030 0016 7850 4e1c 0000 0000 780f 4e70 0000 0000 5367 5818 4af8 0000 7abf
3507660  55f0 4af8 0000 01af 55f0 6bc8 5370 228c 28c4 c030 0017 a5b4 4e1c 0000 0000 780f 4e70 0000 0000 5eef 5818 4af8 0000 7677
3507740  55f0 4af8 0000 01af 55f0 6bc8 5370 228c 28c4 0030 0016 78b0 4e1c 0000 0000 779f 4e70 0000 0000 7be7 5818 4af8 0000 7ad7
3510020  55f0 4af8 0000 7adf 55f0 6bc8 5370 228c 28c4 0030 0017 a670 4e1c 0000 0000 779f 4e70 0000 0000 769f 5818 4af8 0000 7ae7
3510100  55f0 4af8 0000 7aef 55f0 6bc8 5370 228c 28c4 0030 c016 7910 4e1c 0000 0000 7a3f 4e70 0000 0000 7bf7 5818 4af8 0000 7aff
3510160  55f0 4af8 0000 7b07 55f0 6bc8 5370 228c 28c4 c040 0016 7950 4e1c 0000 0000 7a3f 4e70 0000 0000 7bff 5818 4af8 0000 7b2f
3510240  55f0 4af8 0000 7b17 55f0 4af8 0000 7b1f 55f0 4af8 0000 7b27 55f0 6bc8 5370 228c 28c4 0040 0016 7990 4e1c 0000 0000 7a3f
3510320  4e70 0000 0000 7c07 5818 4af8 0000 7b0f 55f0 4af8 0000 7b17 55f0 4af8 0000 7b1f 55f0 4af8 0000 7b27 55f0 6bc8 5370 228c
3510400  28c4 004c 0016 79dc 4e1c 0000 0000 7a3f 4e70 0000 0000 7c0f 5818 4af8 0000 7b37 55f0 4af8 0000 7b17 55f0 4af8 0000 7b3f
3510460  55f0 4af8 0000 7b47 55f0 4af8 0000 7b4f 55f0 5fa0 55f0 6bc8 5370 228c 28c4 004c 0016 7a28 4e1c 0000 0000 7a3f 4e70 0000
3510540  0000 7c17 5818 4af8 0000 7b57 55f0 4af8 0000 7b17 55f0 4af8 0000 7b3f 55f0 4af8 0000 7b47 55f0 4af8 0000 7b4f 55f0 5fa0
3510620  55f0 6bc8 5370 228c 2954 0034 0002 438a 4e1c c000 0000 7a3f 4e70 0000 0000 7c1f 5818 4af8 0000 7b47 55f0 4af8 0000 7b7f
3510700  55f0 5fa0 55f0 6bc8 5370 228c 0016 9014 0000 1260 2728 3827 3030 312c 2042 2c20 6f74 6865 722c 204c 322c 205b 5d29 2e0a
3510760  2755 4e49 5820 6465 636f 6465 2728 7573 6572 2c20 5f2c 2049 642c 204e 616d 6529 203a 2d0a 0927 5144 6e61 6d65 2728 4964
3511040  2c20 302c 204e 616d 652c 2030 292e 0a27 554e 4958 2064 6563 6f64 6527 2867 726f 7570 2c20 5f2c 2049 642c 204e 616d 6529
3511120  203a 2d0a 0927 5144 6e61 6d65 2728 4964 2c20 312c 204e 616d 652c 2030 292e 0a27 554e 4958 2064 6563 6f64 6527 2864 6174
3511200  652c 2048 2c20 4c2c 2044 6174 6529 203a 2d0a 0964 6174 6528 7877 6428 482c 4c29 2c20 4461 7465 292e 0a27 554e 4958 2064
3511260  6563 6f64 6527 2874 696d 652c 2048 2c20 4c2c 2044 6174 696d 6529 203a 2d0a 0964 6174 696d 6528 7877 6428 482c 4c29 2c20
3511340  4461 7469 6d65 292e 0a0a 0a27 554e 4958 2070 6572 6d69 7373 696f 6e20 6269 7427 2842 6974 2c20 4d61 736b 2c20 576f 7264
3511420  2c20 5b57 6f72 647c 4c5d 2c20 4c29 203a 2d0a 094d 6173 6b2f 5c42 6974 203d 5c3d 2030 2c0a 0921 2e0a 2755 4e49 5820 7065
3511500  726d 6973 7369 6f6e 2062 6974 2728 5f2c 205f 2c20 5f2c 204c 2c20 4c29 2e0a 0a0a 2f2a 2020 5468 6520 696e 6469 6365 7320
3511560  6368 6f73 656e 2066 6f72 2074 6865 2066 6f6c 6c6f 7769 6e67 2066 6f75 7220 7072 6f70 6572 7469 6573 0a20 2020 2061 7265
3511640  2074 6865 2070 6172 616d 6574 6572 7320 525f 4f4b 3d34 2c20 575f 4f4b 3d32 2c20 585f 4f4b 3d31 2067 6976 656e 2074 6f20
3511720  7468 650a 2020 2020 554e 4958 2072 6f75 7469 6e65 2061 6363 6573 7328 3229 2e20 2054 6869 7320 6973 2061 2062 6974 206f
3512000  6620 6120 6861 636b 2c20 6275 740a 2020 2020 6174 206c 6561 7374 2079 6f75 206b 6e6f 7720 6162 6f75 7420 6974 2e20 2049
3512060  6e64 6963 6573 2030 2e2e 3920 6172 6520 7265 7365 7276 6564 0a20 2020 2066 6f72 2063 616c 6c73 2074 6f20 6163 6365 7373
3512140  2832 292e 2020 5468 6520 7265 7374 2075 7365 2073 7461 7428 3229 2e0a 2a2f 0a0a 2755 4e49 5820 7072 6f70 6572 7479 2728
3512220  7265 6164 6162 6c65 2c09 5f2c 0909 626f 6f6c 6561 6e2c 2034 292e 0a27 554e 4958 2070 726f 7065 7274 7927 2877 7269 7461
3512300  626c 652c 095f 2c09 0962 6f6f 6c65 616e 2c20 3229 2e0a 2755 4e49 5820 7072 6f70 6572 7479 2728 6578 6563 7574 6162 6c65
3512360  2c09 6669 6c65 2c09 0962 6f6f 6c65 616e 2c20 3129 2e0a 2755 4e49 5820 7072 6f70 6572 7479 2728 7365 6172 6368 6162 6c65
3512440  2c09 6469 7265 6374 6f72 792c 0962 6f6f 6c65 616e 2c20 3129 2e0a 0a0a 2f2a 2020 5468 6520 2264 6174 6522 2061 6e64 2022
3512520  7469 6d65 2220 696e 6469 6365 7320 6172 6520 7468 6520 7361 6d65 3b20 7765 2067 6574 2074 6865 0a20 2020 2073 616d 6520
3512600  6e75 6d62 6572 2062 6163 6b20 6672 6f6d 2051 4470 726f 702e 2020 5468 6520 6469 6666 6572 656e 6365 2069 7320 696e 2077
3512660  6861 740a 2020 2020 7765 2064 6f20 7769 7468 2069 7420 6166 7465 7277 6172 6473 2e20 2049 6e64 6963 6573 2031 302e 2e31
3512740  3520 6172 6520 7265 7365 7276 6564 0a20 2020 2074 696d 6573 7461 6d70 7320 7265 7475 726e 6564 2066 726f 6d20 7374 6174
3513020  2832 292e 0a2a 2f0a 0a27 554e 4958 2070 726f 7065 7274 7927 2861 6363 6573 735f 7469 6d65 2c09 5f2c 0909 7469 6d65 2c20
3513100  3130 292e 0a27 554e 4958 2070 726f 7065 7274 7927 2861 6363 6573 735f 6461 7465 2c09 5f2c 0909 6461 7465 2c20 3130 292e
3513160  0a27 554e 4958 2070 726f 7065 7274 7927 286d 6f64 6966 795f 7469 6d65 2c09 5f2c 0909 7469 6d65 2c20 3131 292e 0a27 554e
3513240  4958 2070 726f 7065 7274 7927 286d 6f64 6966 795f 6461 7465 2c09 5f2c 0909 6461 7465 2c20 3131 292e 0a27 554e 4958 2070
3513320  726f 7065 7274 7927 2863 7265 6174 655f 7469 6d65 2c09 5f2c 0909 7469 6d65 2c20 3132 292e 0a27 554e 4958 2070 726f 7065
3513400  7274 7927 2863 7265 6174 655f 6461 7465 2c09 5f2c 0909 6461 7465 2c20 3132 292e 0a0a 0a2f 2a20 2049 6e64 6963 6573 2031
3513460  362e 2e33 3120 6172 6520 7265 7365 7276 6564 2066 6f72 2070 726f 7065 7274 6965 7320 6f62 7461 696e 6564 2062 790a 2020
3513540  2020 7368 6966 7469 6e67 2074 6865 206d 6f64 6520 7269 6768 7420 696e 6465 782d 3136 2062 6974 732e 2020 4765 6e65 7261
3513620  6c6c 792c 206f 6e6c 790a 2020 2020 7468 6520 626f 7474 6f6d 2062 6974 2069 7320 6f66 2069 6e74 6572 6573 742c 2062 7574
3513700  2066 6f72 2074 6865 2077 686f 5f63 616e 5f78 7878 0a20 2020 2070 726f 7065 7274 6965 7320 7468 6520 6269 7473 2061 7265
```

| | | | | | | | | | | | | | | | | | | | | | | | | |
|---|---|---|---|---|---|---|---|---|---|---|---|---|---|---|---|---|---|---|---|---|---|---|---|---|
| 3513760 | 2038 | 2731 | 3131 | 2e0a | 2a2f | 0a0a | 2755 | 4e49 | 5820 | 7072 | 6f70 | 6572 | 7479 | 2728 | 7365 | 745f | 7573 | 6572 | 5f69 | 642c | 0920 | 6669 | 6c65 | 2c09 |
| 3514040 | 0962 | 6f6f | 6c65 | 616e | 2c20 | 3237 | 292c | 0925 | 2038 | 2734 | 3030 | 300a | 2755 | 4e49 | 5820 | 7072 | 6f70 | 6572 | 7479 | 2728 | 7365 | 745f | 6772 | 6f75 |
| 3514120 | 725f | 6964 | 2c09 | 2066 | 696c | 652c | 0909 | 626f | 6f6c | 6561 | 6e2c | 2032 | 3629 | 2e09 | 2520 | 3827 | 3230 | 3030 | 0a27 | 554e | 4958 | 2070 | 726f | 7065 |
| 3514200 | 7274 | 7927 | 2873 | 6176 | 655f | 7465 | 7874 | 2c09 | 2066 | 696c | 652c | 0909 | 626f | 6f6c | 6561 | 6e2c | 2032 | 3529 | 2e09 | 2520 | 3827 | 3130 | 3030 | 0a27 |
| 3514260 | 554e | 4958 | 2070 | 726f | 7065 | 7274 | 7927 | 2877 | 686f | 5f63 | 616e | 5f72 | 6561 | 642c | 0920 | 5f2c | 0909 | 7768 | 6f2c | 0920 | 3138 | 292e | 0925 | 2038 |
| 3514340 | 2730 | 3434 | 340a | 2755 | 4e49 | 5820 | 7072 | 6f70 | 6572 | 7479 | 2728 | 7768 | 6f5f | 6361 | 6e5f | 7772 | 6974 | 652c | 0920 | 5f2c | 0909 | 7768 | 6f2c | 0920 |
| 3514420 | 3137 | 292e | 0925 | 2038 | 2730 | 3232 | 320a | 2755 | 4e49 | 5820 | 7072 | 6f70 | 6572 | 7479 | 2728 | 7768 | 6f5f | 6361 | 6e5f | 6578 | 6563 | 7574 | 652c | 2066 |
| 3514500 | 696c | 652c | 0909 | 7768 | 6f2c | 0920 | 3136 | 292e | 0925 | 2038 | 2730 | 3131 | 310a | 2755 | 4e49 | 5820 | 7072 | 6f70 | 6572 | 7479 | 2728 | 7768 | 6f5f | 6361 |
| 3514560 | 6e5f | 7365 | 6172 | 6368 | 2c20 | 2064 | 6972 | 6563 | 746f | 7279 | 2c09 | 7768 | 6f2c | 0920 | 3136 | 292e | 0925 | 2038 | 2730 | 3131 | 310a | 0a2f | 2a20 | 2054 |
| 3514640 | 6865 | 2072 | 656d | 6169 | 6e69 | 6e67 | 2069 | 6e64 | 6963 | 6573 | 2c20 | 3430 | 2e2e | 2e2c | 2061 | 7265 | 2064 | 6973 | 6365 | 6c6c | 616e | 656f | 7573 | 2e0a |
| 3514720 | 2020 | 2020 | 4c69 | 6b65 | 2074 | 6869 | 6e67 | 7320 | 6172 | 6520 | 6772 | 6f75 | 7065 | 6420 | 746f | 6765 | 7468 | 6572 | 2c20 | 6275 | 7420 | 7468 | 6174 | 2069 |
| 3515000 | 7320 | 616c | 6c2e | 0a2a | 2f0a | 0a27 | 554e | 4958 | 2070 | 726f | 7065 | 7274 | 7927 | 286f | 776e | 6572 | 5f75 | 7365 | 725f | 6964 | 2c09 | 205f | 2c09 | 0969 |
| 3515060 | 6e74 | 6567 | 6572 | 2c20 | 3430 | 292e | 0a27 | 554e | 4958 | 2070 | 726f | 7065 | 7274 | 7927 | 286f | 776e | 6572 | 5f75 | 7365 | 725f | 6e61 | 6d65 | 2c20 | 5f2c |
| 3515140 | 0909 | 7573 | 6572 | 2c09 | 2034 | 3029 | 2e0a | 2755 | 4e49 | 5820 | 7072 | 6f70 | 6572 | 7479 | 2728 | 6f77 | 6e65 | 725f | 6772 | 6f75 | 705f | 6964 | 2c20 | 205f |
| 3515220 | 2c09 | 0969 | 6e74 | 6567 | 6572 | 2c20 | 3431 | 292e | 0a27 | 554e | 4958 | 2070 | 726f | 7065 | 7274 | 7927 | 286f | 776e | 6572 | 5f67 | 726f | 7570 | 5f6e | 616d |
| 3515300 | 652c | 205f | 2c09 | 0967 | 726f | 7570 | 2c20 | 2020 | 3431 | 292e | 0a27 | 554e | 4958 | 2070 | 726f | 7065 | 7274 | 7927 | 286f | 6e6c | 795f | 6f6e | 655f | 6c69 |
| 3515360 | 6e6b | 2c09 | 2066 | 696c | 652c | 0909 | 626f | 6f6c | 6561 | 6e2c | 2034 | 3229 | 2e0a | 2755 | 4e49 | 5820 | 7072 | 6f70 | 6572 | 7479 | 2728 | 6e75 | 6d62 | 6572 |
| 3515440 | 5f6f | 665f | 6c69 | 6e6b | 732c | 2066 | 696c | 652c | 0909 | 696e | 7465 | 6765 | 722c | 2034 | 3329 | 2e0a | 2755 | 4e49 | 5820 | 7072 | 6f70 | 6572 | 7479 | 2728 |
| 3515520 | 7369 | 7a65 | 5f69 | 6e5f | 6279 | 7465 | 732c | 2020 | 2066 | 696c | 652c | 0909 | 696e | 7465 | 6765 | 722c | 2034 | 3429 | 2e0a | 2755 | 4e49 | 5820 | 7072 | 6f70 |
| 3515600 | 6572 | 7479 | 2728 | 7369 | 7a65 | 5f69 | 6e5f | 626c | 6f63 | 6b73 | 2c20 | 2066 | 696c | 652c | 0909 | 696e | 7465 | 6765 | 722c | 2034 | 3529 | 2e0a | 2755 | 4e49 |
| 3515660 | 5820 | 7072 | 6f70 | 6572 | 7479 | 2728 | 626c | 6f63 | 6b5f | 7369 | 7a65 | 2c09 | 2066 | 696c | 652c | 0909 | 696e | 7465 | 6765 | 722c | 2034 | 3629 | 2e0a | 0a0a |
| 3515740 | 2f2a | 2020 | 2d2d | 2d2d | 2d2d | 2d2d | 2d2d | 2d2d | 2d2d | 2d2d | 2043 | 2072 | 6f75 | 7469 | 6e65 | 7320 | 2d2d | 2d2d | 2d2d | 2d2d | 2d2d | 2d2d | 2d2d | 2d2d |
| 3516020 | 2020 | 2a2f | 0a0a | 0a66 | 6f72 | 6569 | 676e | 5f66 | 696c | 6528 | 7379 | 7374 | 656d | 2827 | 6469 | 7265 | 6374 | 6f72 | 792e | 6f27 | 292c | 205b | 0a09 | 2751 |
| 3516100 | 4469 | 6e69 | 7427 | 2c20 | 2751 | 446e | 6578 | 7427 | 2c20 | 2751 | 4470 | 6172 | 7427 | 2c0a | 0927 | 5144 | 7465 | 7374 | 272c | 2027 | 5144 | 6e61 | 6d65 | 272c |
| 3516160 | 2027 | 5144 | 7072 | 6f70 | 272c | 0a09 | 2751 | 4468 | 6572 | 6527 | 0a20 | 2020 | 205d | 292e | 0a0a | 666f | 7265 | 6967 | 6e28 | 2751 | 4469 | 6e69 | 7427 | 2c20 |
| 3516240 | 2751 | 4469 | 6e69 | 7427 | 282b | 7374 | 7269 | 6e67 | 2c2b | 7374 | 7269 | 6e67 | 2c2b | 696e | 7465 | 6765 | 722c | 2b69 | 6e74 | 6567 | 6572 | 2c5b | 2d69 | 6e74 |
| 3516320 | 6567 | 6572 | 5d29 | 292e | 0a66 | 6f72 | 6569 | 676e | 2827 | 5144 | 6e65 | 7874 | 272c | 2027 | 5144 | 6e65 | 7874 | 2728 | 2d73 | 7472 | 696e | 672c | 2d73 | 7472 |
| 3516400 | 696e | 672c | 5b2d | 696e | 7465 | 6765 | 725d | 2929 | 2e0a | 666f | 7265 | 6967 | 6e28 | 2751 | 4470 | 6172 | 7427 | 2c20 | 2751 | 4470 | 6172 | 7427 | 282d | 7374 |
| 3516460 | 7269 | 6e67 | 2c20 | 2020 | 2020 | 2020 | 222b | 696e | 7465 | 6765 | 722c | 2b69 | 6e74 | 6567 | 6572 | 2c0a | 0909 | 0920 | 2020 | 2d73 | 7472 | 696e | 672c | 2b73 |
| 3516540 | 7472 | 696e | 672c | 5b2d | 696e | 7465 | 6765 | 725d | 2929 | 2e0a | 666f | 7265 | 6967 | 6e28 | 2751 | 4474 | 6573 | 7427 | 2c20 | 2751 | 4474 | 6573 | 7427 | 282b |
| 3516620 | 7374 | 7269 | 6e67 | 2c2b | 7374 | 7269 | 6e67 | 2c2b | 696e | 7465 | 6765 | 722c | 2b69 | 6e74 | 6567 | 6572 | 2c0a | 0909 | 0920 | 2020 | 2b73 | 7472 | 696e | 672c |
| 3516700 | 2d73 | 7472 | 696e | 672c | 5b2d | 696e | 7465 | 6765 | 725d | 2929 | 2e0a | 666f | 7265 | 6967 | 6e28 | 2751 | 446e | 616d | 6527 | 2c20 | 2751 | 446e | 616d | 6527 |
| 3516760 | 282b | 696e | 7465 | 6765 | 722c | 2b69 | 6e74 | 6567 | 6572 | 2c2d | 7374 | 7269 | 6e67 | 2c5b | 2d69 | 6e74 | 6567 | 6572 | 5d29 | 292e | 0a66 | 6f72 | 6569 | 676e |
| 3517040 | 2827 | 5144 | 7072 | 6f70 | 272c | 2027 | 5144 | 7072 | 6f70 | 2728 | 2b73 | 7472 | 696e | 672c | 2b73 | 7472 | 696e | 672c | 2b69 | 6e74 | 6567 | 6572 | 2c0a | 0909 |
| 3517120 | 0920 | 2020 | 2d69 | 6e74 | 6567 | 6572 | 2c2d | 696e | 7465 | 6765 | 722c | 5b2d | 696e | 7465 | 6765 | 725d | 2929 | 2e0a | 666f | 7265 | 6967 | 6e28 | 2751 | 4468 |
| 3517200 | 6572 | 6527 | 2c20 | 6375 | 7272 | 656e | 745f | 6469 | 7265 | 6374 | 6f72 | 7928 | 5b2d | 7374 | 7269 | 6e67 | 5d29 | 292e | 0a0a | 3a2d | 2075 | 7365 | 723a | 656e |
| 3517260 | 7375 | 7265 | 5f6c | 6f61 | 6465 | 6428 | 6561 | 6363 | 6573 | 7329 | 2c0a | 2020 | 206c | 6f61 | 645f | 666f | 7265 | 6967 | 6e5f | 6669 | 6c65 | 7328 | 5b73 | 7973 |
| 3517340 | 7465 | 6d28 | 2764 | 6972 | 6563 | 746f | 7279 | 2e6f | 2729 | 5d2c | 205b | 5d29 | 2c0a | 2020 | 2061 | 626f | 6c69 | 7368 | 2866 | 6f72 | 6569 | 676e | 5f66 | 696c |
| 3517420 | 652c | 2032 | 292c | 0a20 | 2020 | 6162 | 6f6c | 6973 | 6828 | 666f | 7265 | 6967 | 6e2c | 2032 | 292e | 0a0a | 0a72 | 7928 | 4469 | 7265 | 6374 | 6f72 | 792c | 2053 |
| 3517500 | 6574 | 2920 | 3a2d | 0a09 | 2751 | 4427 | 2844 | 6972 | 6563 | 746f | 7279 | 2c20 | 272a | 272c | 2038 | 2731 | 3030 | 3030 | 302c | 2038 | 2734 | 3030 | 3030 | 2c20 |
| 3517560 | 5365 | 7429 | 2e0a | 0a0a | 2520 | 2020 | 6669 | 6c65 | 5f63 | 656d | 6265 | 7273 | 5f6f | 665f | 6469 | 7265 | 6374 | 6f72 | 7928 | 2b44 | 6972 | 6563 | 746f | 7279 |
| 3517640 | 2c20 | 2b50 | 6174 | 7465 | 726e | 2c20 | 2d53 | 6574 | 290a | 2520 | 2020 | 6973 | 2074 | 7275 | 6520 | 7768 | 656e | 2053 | 6574 | 2069 | 7320 | 6120 | 7365 | 7420 |
| 3517720 | 6f66 | 2053 | 686f | 7274 | 4e61 | 6d65 | 2046 | 756c | 6c4e | 616d | 6520 | 7061 | 6972 | 7320 | 6265 | 696e | 6720 | 7468 | 650a | 2520 | 2020 | 7265 | 6c61 | 7469 |
| 3520000 | 7665 | 2061 | 6e64 | 2061 | 6273 | 6f6c | 7574 | 6520 | 6e61 | 6d65 | 7320 | 6f66 | 2073 | 7562 | 6469 | 7265 | 6374 | 6f72 | 6965 | 7320 | 6f66 | 2074 | 6865 | 2067 |
| 3520060 | 6976 | 656e | 2044 | 6972 | 6563 | 746f | 7279 | 2c0a | 2520 | 2020 | 7375 | 6368 | 2074 | 6861 | 7420 | 6561 | 6368 | 2053 | 686f | 7274 | 4e61 | 6d65 | 206d | 6174 |
| 3520140 | 6368 | 6573 | 2074 | 6865 | 2067 | 6976 | 656e | 2050 | 6174 | 7465 | 726e | 2e0a | 0a66 | 696c | 655f | 6465 | 6d62 | 6572 | 735f | 6f66 | 5f64 | 6972 | 6563 | 746f |
| 3520220 | 7279 | 2844 | 6972 | 6563 | 746f | 7279 | 2c20 | 5061 | 7474 | 6572 | 6e2c | 2053 | 6574 | 2920 | 3a2d | 0a09 | 2751 | 4427 | 2844 | 6972 | 6563 | 746f | 7279 | 2c20 |
| 3520300 | 5061 | 7474 | 6572 | 6e2c | 2038 | 2731 | 3030 | 3030 | 302c | 2038 | 2734 | 3030 | 3030 | 2c20 | 5365 | 7429 | 2e0a | 0a0a | 0a27 | 5144 | 2728 | 4469 | 7265 | 6374 |
| 3520360 | 6f72 | 792c | 2027 | 2a27 | 2c20 | 4d75 | 7374 | 2c20 | 4d75 | 7374 | 6e74 | 2c20 | 4669 | 6c65 | 4e61 | 6d65 | 2c20 | 4675 | 6c6c | 4e61 | 6d65 | 2920 | 3a2d | 0a09 |
| 3520440 | 6e6f | 6e76 | 6172 | 2846 | 756c | 6c4e | 616d | 6529 | 2c0a | 0921 | 2c0a | 0947 | 6f61 | 6c20 | 3d20 | 2751 | 4427 | 2844 | 6972 | 6563 | 746f | 7279 | 2c20 | 272a |
| 3520520 | 272c | 204d | 7573 | 742c | 204d | 7573 | 746e | 742c | 2046 | 696c | 654e | 616d | 652c | 2046 | 756c | 6c4e | 616d | 6529 | 2c0a | 096d | 7573 | 745f | 6265 | 5f6e |
| 3520600 | 6f6e | 6e65 | 6728 | 4175 | 7374 | 2c20 | 2020 | 2020 | 2033 | 2c20 | 476f | 616c | 292c | 0a09 | 6d75 | 7374 | 5f62 | 655f | 6e6f | 6e6e | 6567 | 284d | 7573 | 746e |
| 3520660 | 742c | 0920 | 2034 | 2c20 | 476f | 616c | 292c | 0a09 | 6d75 | 7374 | 5f62 | 655f | 7379 | 6d62 | 6f6c | 2846 | 756c | 6c4e | 616d | 652c | 2020 | 362c | 2047 | 6f61 |
| 3520740 | 6c29 | 2c0a | 0927 | 5144 | 7061 | 7274 | 2728 | 4469 | 7265 | 6374 | 6f72 | 792c | 204d | 7573 | 742c | 204d | 7573 | 746e | 742c | 2046 | 696c | 654e | 616d | 652c |
| 3521020 | 2046 | 756c | 6c4e | 616d | 652c | 2030 | 292e | 0a27 | 5144 | 2728 | 4469 | 7265 | 6374 | 6f72 | 792c | 2050 | 6174 | 7465 | 726e | 2c20 | 4d75 | 7374 | 2c20 | 4d75 |

| | | | | | | | | | | | | | | | | | | | | | | | | |
|---|---|---|---|---|---|---|---|---|---|---|---|---|---|---|---|---|---|---|---|---|---|---|---|---|
| 3521100 | 7374 | 6e74 | 2c20 | 4669 | 6c65 | 4e61 | 6d65 | 2c20 | 4675 | 6c6c | 4e61 | 6d65 | 2920 | 3a2d | 0a09 | 6e6f | 6e76 | 6172 | 2846 | 696c | 654e | 616d | 6529 | 2c0a |
| 3521160 | 0921 | 2c0a | 0947 | 6f61 | 6c20 | 3d20 | 2751 | 4427 | 2844 | 6972 | 6563 | 746f | 7279 | 2c20 | 5061 | 7474 | 6572 | 6e2c | 204d | 7573 | 742c | 204d | 7573 | 746e |
| 3521240 | 742c | 2046 | 696c | 654e | 616d | 652c | 2046 | 756c | 6c4e | 616d | 6529 | 2c0a | 096d | 7573 | 745f | 6265 | 5f73 | 796d | 626f | 6c29 | 4469 | 7265 | 6374 | 6f72 |
| 3521320 | 792c | 2031 | 2c20 | 476f | 616c | 292c | 0a09 | 6d75 | 7374 | 5f62 | 655f | 7379 | 6d62 | 6f6c | 2850 | 6174 | 7465 | 726e | 2c20 | 2020 | 322c | 2047 | 6f61 | 6c29 |
| 3521400 | 2c0a | 096d | 7573 | 745f | 6265 | 5f6e | 6f6e | 6e65 | 6728 | 4d75 | 7374 | 2c20 | 2020 | 2020 | 2033 | 2c20 | 476f | 616c | 292c | 0a09 | 6d75 | 7374 | 5f62 | 655f |
| 3521460 | 6e6f | 6e6e | 6567 | 284d | 7573 | 746e | 742c | 0920 | 2034 | 2c20 | 476f | 616c | 292c | 0a09 | 6d75 | 7374 | 5f62 | 655f | 7379 | 6d62 | 6f6c | 2846 | 696c | 654e |
| 3521540 | 616d | 652c | 2020 | 352c | 2047 | 6f61 | 6c29 | 2c0a | 0927 | 5144 | 7465 | 7374 | 2728 | 4469 | 7265 | 6374 | 6f72 | 792c | 2050 | 6174 | 7465 | 726e | 2c20 | 4d75 |
| 3521620 | 7374 | 2c20 | 4d75 | 7374 | 6e74 | 2c20 | 4669 | 6c65 | 4e61 | 6d65 | 2c20 | 4675 | 6c6c | 4e61 | 6d65 | 2c20 | 3029 | 2e0a | 2751 | 4427 | 2844 | 6972 | 6563 | 746f |
| 3521700 | 7279 | 2c20 | 5061 | 7474 | 6572 | 6e2c | 204d | 7573 | 742c | 204d | 7573 | 746e | 742c | 2046 | 696c | 654e | 616d | 652c | 2046 | 756c | 6c4e | 616d | 6529 | 203a |
| 3521760 | 2d0a | 0947 | 6f61 | 6c20 | 3d20 | 2751 | 4427 | 2844 | 6972 | 6563 | 746f | 7279 | 2c20 | 5061 | 7474 | 6572 | 6e2c | 204d | 7573 | 742c | 204d | 7573 | 746e | 742c |
| 3522040 | 2046 | 696c | 654e | 616d | 652c | 2046 | 001d | 6469 | 7265 | 6374 | 6f72 | 795f | 6d65 | 6d62 | 6572 | 5f6f | 665f | 6469 | 7265 | 6374 | 6f72 | 7900 | 001e | 6469 |
| 3522120 | 7265 | 6374 | 6f72 | 795f | 6d65 | 6d62 | 6572 | 735f | 6f66 | 5f64 | 6972 | 6563 | 746f | 7279 | 0000 | 0ddf | 0012 | 6469 | 7265 | 6374 | 6f72 | 795f | 7072 | 6f70 |
| 3522200 | 6572 | 7479 | 0000 | 0ddf | 0018 | 6669 | 6c65 | 5f6d | 6561 | 6265 | 725f | 6f66 | 5f64 | 6972 | 6563 | 746f | 7279 | 0045 | 0019 | 6669 | 6c65 | 5f6d | 656d | 6265 |
| 3522260 | 7273 | 5f6f | 665f | 6469 | 7265 | 6374 | 6f72 | 7900 | 0016 | 468c | 0013 | 7ff8 | 000e | 4700 | 0000 | 0000 | 0016 | 4364 | 0016 | 8d58 | 0012 | c100 | 0100 | 7847 |
| 3522340 | 0000 | 20e7 | 0000 | 0004 | 0017 | 7ae8 | 0017 | 7ae8 | 0021 | 0000 | 0000 | 0000 | 0000 | 7847 | b328 | 0007 | 0016 | 2660 | 0000 | 0000 | 0012 | c140 | 0200 | 784f |
| 3522420 | 0000 | 20e7 | 0000 | 0008 | 0016 | 30e4 | 0016 | 30e4 | 0001 | 007d | 0000 | 0000 | 0000 | 784f | b464 | 0ddf | 0016 | 2694 | 0016 | 4bd0 | 0016 | 8d98 | 0300 | 784f |
| 3522500 | 0000 | 20e7 | 0000 | 000c | 0016 | 3158 | 0016 | 3158 | 0001 | 007d | 0000 | 0000 | 0016 | 8dc8 | 0400 | 784f | 0000 | 20e7 | 0000 | 0010 | 0016 | b1f0 | 0016 | b1f0 |
| 3522560 | 0001 | 007d | 0000 | 0000 | 0012 | c194 | 0100 | 7857 | 0000 | 20e7 | 0000 | 0004 | 0016 | 31f8 | 0016 | 31f8 | 0001 | 007d | 0000 | 0000 | 0000 | 7857 | b464 | 0007 |
| 3522640 | 0016 | 2730 | 0016 | 4bc4 | 0016 | 8e08 | 0200 | 7857 | 0000 | 20e7 | 0000 | 0008 | 0016 | 3268 | 0016 | 3268 | 0001 | 007d | 0000 | 0000 | 0016 | 8e38 | 0300 | 7857 |
| 3522720 | 0000 | 20e7 | 0000 | 000c | 0016 | b270 | 0016 | b270 | 0001 | 007d | 0000 | 0000 | 0012 | c1b4 | 0200 | 785f | 0000 | 20e7 | 0000 | 0008 | 0016 | b478 | 0016 | b478 |
| 3523000 | 0001 | 007d | 0000 | 0000 | 0000 | 785f | b464 | 0007 | 0016 | 27cc | 0016 | 4bac | 0016 | 8e78 | 0300 | 785f | 0000 | 20e7 | 0000 | 000c | 0016 | b4cc | 0016 | b4cc |
| 3523060 | 0001 | 007d | 0000 | 0000 | 0012 | c1e8 | 0200 | 7867 | 0000 | 20e7 | 0000 | 0008 | 0016 | 3304 | 0016 | 3304 | 0001 | 007d | 0000 | 0000 | 0000 | 7867 | b464 | 0007 |
| 3523140 | 0016 | 2834 | 0016 | 4b80 | 0016 | 8ec8 | 0300 | 7867 | 0000 | 20e7 | 0000 | 000c | 0016 | 3378 | 0016 | 3378 | 0001 | 007d | 0000 | 0000 | 0016 | 8ef8 | 0400 | 7867 |
| 3523220 | 0000 | 20e7 | 0000 | 0010 | 0016 | b2bc | 0016 | b2bc | 0001 | 007d | 0000 | 0000 | 0012 | c21c | 0100 | 786f | 0000 | 20e7 | 0000 | 0004 | 0016 | 3418 | 0016 | 3418 |
| 3523300 | 0001 | 007d | 0000 | 0000 | 0000 | 786f | b464 | 8e1a | 0016 | 28d0 | 0016 | 4b60 | 0016 | 8f38 | 0200 | 786f | 0000 | 20e7 | 0000 | 0008 | 0016 | 3488 | 0016 | 3488 |
| 3523360 | 0001 | 007d | 0000 | 000c | 0016 | 8f68 | 0300 | 786f | 0000 | 20e7 | 0000 | 000c | 0016 | b32c | 0016 | b32c | 0001 | 007d | 0000 | 0000 | b464 | 8fb6 | 0016 | 2938 |
| 3523440 | 0000 | 0000 | 0012 | c270 | 0200 | 7877 | 0000 | 20e7 | 0000 | 0008 | 0016 | b4f8 | 0016 | b4f8 | 0001 | 007d | 0000 | 0000 | 0000 | 7877 | b464 | 0007 | 0016 | 296c |
| 3523520 | 0016 | 9004 | 0016 | 8fb4 | 0300 | 7877 | 0000 | 20e7 | 0000 | 000c | 0016 | b52c | 0016 | b52c | 0001 | 007d | 0000 | 0000 | b464 | 8ff1 | 0016 | 29a0 | 0000 | 0000 |
| 3523600 | 0016 | 9104 | 0000 | 00bc | b288 | b66c | 0000 | 1093 | 7fff | ffff | 0017 | a85c | 0200 | 0db5 | 0100 | 15ad | 0100 | 33fd | 0000 | 000b | 0000 | 315f | 0016 | 906c |
| 3523660 | 0000 | 002c | b288 | b66c | 0000 | 1093 | 7fff | ffff | 0016 | 9018 | 0200 | 0db5 | 0100 | 15ad | 0100 | 33fd | 0000 | 000b | 0000 | 315f | 0016 | 90a4 | 0000 | 0038 |
| 3523740 | b27c | b66c | 0000 | 1094 | 0000 | 10a1 | 0016 | 9108 | 0200 | 0db5 | 0500 | 1cdd | 0000 | 7707 | 0000 | 000b | 0000 | 3287 | 00bd | 4163 | 0000 | 03e3 | 0000 | 315f |
| 3524020 | 0016 | 9104 | 0000 | 002c | b4f0 | b4e4 | 0000 | 1093 | 7fff | ffff | 0008 | b0dd | 0000 | 0000 | 0000 | 0000 | 0016 | 9560 | 0002 | 438a | 0017 | abcc | 28c4 | 0034 |
| 3524100 | 0017 | a89c | 45b8 | 39a4 | 000d | 7d48 | 0010 | 2ecc | 31f0 | 35c8 | 4e1c | 0000 | 0000 | 7c2f | 31f0 | 362c | 4e1c | 0000 | 0000 | 7c37 | 2420 | 0000 | 0017 | a88c |
| 3524160 | 0016 | 9174 | 0000 | 0038 | b27c | b66c | 0000 | 1095 | 0000 | 10a2 | 0016 | 9178 | 0200 | 0db5 | 0500 | 1cdd | 0000 | 7707 | 0000 | 0013 | 0000 | 3287 | 00b2 | 3ee3 |
| 3524240 | 0000 | 03e3 | 0000 | 315f | 28c4 | 0038 | 0017 | a914 | 45b8 | 46ec | 3b4c | 0000 | 000d | 7d48 | 0014 | 2ecc | 31f0 | 35c8 | 4e1c | 0000 | 0000 | 7c2f | 31f0 | 3690 |
| 3524320 | 4e1c | 0000 | 0000 | 7c37 | 3858 | 2340 | 0017 | a904 | 0016 | 91e8 | 0000 | 0038 | b27c | b66c | 0000 | 1096 | 0000 | 10a3 | 0016 | 91ec | 0200 | 0db5 | 0500 | 1cdd |
| 3524400 | 0000 | 7707 | 0000 | 001b | 0000 | 3287 | 00bd | 4463 | 0000 | 03e3 | 0000 | 315f | 2c78 | 003c | 0002 | 438a | 2520 | 46d8 | 4754 | 3858 | 37dc | 247c | 0017 | a960 |
| 3524460 | 0014 | 39a4 | 0017 | a980 | 0014 | 39f8 | 0017 | 9f94 | 0014 | 4550 | 6d50 | 5370 | 4538 | 6d0c | 6bb4 | 234c | 0017 | a9a0 | 0016 | 925c | 0000 | 0038 | b27c | b66c |
| 3524540 | 0000 | 1097 | 0000 | 10a4 | 0016 | 9260 | 0200 | 0db5 | 0500 | 1cdd | 0000 | 7707 | 0000 | 0023 | 0000 | 3287 | 00bd | 4823 | 0000 | 03e3 | 0000 | 315f | 2c78 | 003c |
| 3524620 | 0002 | 438a | 2520 | 46d8 | 47bc | 38c0 | 37dc | 247c | 0017 | a9c0 | 0014 | 39a4 | 0017 | a980 | 0014 | 39f8 | 0017 | 9f94 | 0014 | 4550 | 6d50 | 5370 | 4538 | 6d0c |
| 3524700 | 6bb4 | 234c | 0017 | a9a0 | 0016 | 92ec | 0000 | 0038 | b27c | b66c | 0000 | 1098 | 0000 | 10a5 | 0016 | 92f0 | 0200 | 0db5 | 0500 | 1cdd | 0000 | 7c3f | 0000 | 001b |
| 3524760 | 0000 | 3287 | 00bd | 4b03 | 0000 | 03e3 | 0000 | 315f | 2c78 | 0058 | 0002 | 438a | 45d0 | 3574 | 4754 | 33a0 | 4254 | 0000 | 0000 | 3387 | 24d0 | 0000 | 0008 | d3dc |
| 3525040 | 0018 | 3804 | 3b4c | 0000 | 0017 | aa20 | 0014 | 4568 | 6d50 | 5370 | 4254 | 0000 | 0000 | 7c5f | 3b4c | 0000 | 0008 | c11c | 0010 | 39a4 | 0008 | c09c | 0010 | 3cf4 |
| 3525120 | 242c | 0000 | 0008 | b95c | 0016 | 93d0 | 0000 | 0070 | b27c | b66c | 0000 | 1099 | 0000 | 10a6 | 0016 | 9328 | 0200 | 0db5 | 0500 | 1cdd | 0000 | 7c3f | 0000 | 0023 |
| 3525200 | 0000 | 3287 | 00bd | 4e03 | 0000 | 03e3 | 0000 | 315f | 0016 | 93d0 | 0000 | 0038 | b27c | b66c | 0000 | 109a | 0000 | 10a7 | 0016 | 9314 | 0200 | 0db5 | 0500 | 1cdd |
| 3525260 | 0000 | 7c3f | 0000 | 002b | 0000 | 3287 | 00bd | 52e3 | 0000 | 03e3 | 0000 | 315f | 2c78 | 0074 | 0002 | 438a | 45e8 | 001c | 3574 | 4768 | 47bc | 4864 | 0018 | 33a0 |
| 3525340 | 4254 | 0000 | 0000 | 3387 | 24d0 | 0000 | 0008 | d3dc | 0020 | 382c | 001c | 39a4 | 0017 | aa20 | 001c | 4568 | 6dd8 | 5370 | 4254 | 0000 | 0000 | 7c67 | 3b4c | 0000 |
| 3525420 | 0008 | c11c | 0018 | 4538 | 6d94 | 5370 | 4568 | 6d50 | 6b74 | 41e8 | 0000 | 7c6f | 3b4c | 0000 | 0008 | c11c | 0010 | 3cf4 | 242c | 0000 | 0008 | b95c | 0016 | 9480 |
| 3525500 | 0000 | 0038 | b27c | b66c | 0000 | 109b | 0000 | 10a8 | 0016 | 9484 | 0200 | 0db5 | 0500 | 1cdd | 0000 | 7c57 | 0000 | 0013 | 0000 | 3287 | 00bd | 5103 | 0000 | 03e3 |
| 3525560 | 0000 | 315f | 2954 | 0078 | 0002 | 438a | 45b8 | 33d8 | 32d4 | 247c | 000d | d604 | 001c | 933c | 9410 | 2ecc | 4568 | 6dd8 | 5370 | 41e8 | 0000 | 7c77 | 3b4c | 0000 |
| 3525640 | 0008 | c11c | 0018 | 2ba0 | 0018 | 002e | 313c | 329c | 24d0 | 0000 | 000c | 4138 | 0014 | 9314 | 9410 | 4568 | 6d50 | 5370 | 4254 | 0000 | 0000 | 7c7f | 3b4c | 0000 |
| 3525720 | 0008 | c11c | 0010 | c5a8 | 2c58 | 437c | 4254 | 0000 | 0000 | 7c87 | 2420 | 0000 | 0008 | c11c | 0016 | 955c | 0000 | 0038 | b27c | b66c | 0000 | 109c | 0000 | 10a9 |
| 3526000 | 0016 | 9560 | 0200 | 0db5 | 0500 | 1cdd | 0000 | 7c47 | 0000 | 000b | 0000 | 3287 | 00bd | 4c03 | 0000 | 03e3 | 0000 | 315f | 2c78 | 00a4 | 0002 | 438a | 45b8 | 42ac |
| 3526060 | 0000 | 7c8f | 0008 | ec1c | 0010 | 247c | 0008 | d13c | 0010 | 2ba0 | 0010 | 005a | 4538 | 4af8 | 0000 | 7caf | 5370 | 4550 | 6d0c | 6b74 | 4538 | 4af8 | 0000 | 7ca7 |
| 3526140 | 6bb4 | 4550 | 4b8c | 0000 | 0000 | 7c9f | 6b74 | 4538 | 4b8c | 0000 | 0000 | 7c97 | 6bb4 | 247c | 0015 | 3d5c | 000c | 2ecc | 4300 | 0000 | 0000 | 7cb7 | 0008 | ec1c |

```
3526220  000c 247c 0008 d13c 000c 234c 0008 d13c 2c58 247c 0008 d13c 000c 42ac 0000 7cbf 0008 ec1c 000c 247c 0008 d13c 000c 247c
3526300  0008 d13c 000c c5a8 0016 95d0 0000 0038 b130 b66c 0000 109d 0000 10aa 0016 90a9 0200 0db5 0500 1cdd 0000 7c4f 0000 000b
3526360  0000 3287 00bd 4d03 0000 03e3 0000 315f 27f0 003c c017 ab94 45c4 39f8 000d 7d48 0014 2ecc 33a0 41e8 0000 5f5f 3ba0 0000
3526440  0015 369c 0010 4550 6d0c 5370 4538 4af8 0000 7cc7 6bb4 234c 0015 3d5c 0016 bd84 0000 1a4c 2525 2525 2525 2525 2525 2525
3526520  2525 2525 2525 2525 2525 2525 2525 2525 2525 2525 2525 2525 2525 2525 2525 2525 2525 2525 2525 2525 2525 2525 2525 0a25
3526600  2520 5468 6520 666f 6c6c 6f77 696e 6720 7072 6564 6963 6174 6573 2073 7065 6369 6679 2077 6861 7420 6c69 6e65 2074 6f20
3526660  6c6f 6f6b 2066 6f72 2061 6e64 2069 6e20 7768 6174 2066 696c 6521 0a25 250a 0a70 726f 6365 7373 5f69 7465 6d28 5f2c 2049
3526740  7465 6d2c 205b 5d29 203a 2d0a 096d 656d 6265 7228 4974 656d 2c20 5b65 6e64 2c20 656e 645f 6f66 5f66 696c 655d 292c 2021
3527020  2e0a 2525 0a25 2520 466f 7220 4368 6970 7369 7a65 720a 2525 0a70 726f 6365 7373 5f69 7465 6d28 6368 6970 7369 7a65 722c
3527100  2745 7374 696d 6174 6564 272c 5b27 4573 7469 6d61 7465 6427 2c66 756e 6374 696f 6e2c 7369 7a65 2c5f 2c5f 2c5f 2c5f 2c5f
3527160  5429 203a 2d20 212e 0a0a 2525 0a25 2520 466f 7220 5379 6e6f 7073 7973 0a25 250a 7072 6f63 6573 735f 6974 656d 2873 796e
3527240  6f70 7379 732c 2027 436f 6d62 696e 6174 696f 6e61 6c27 2c20 5b27 436f 6d62 696e 6174 696f 6e61 6c27 2c20 2761 7265 613a
3527320  272c 205f 5d29 3a2d 2021 2e0a 7072 6f63 6573 735f 6974 656d 2873 796e 6f70 7379 732c 2027 4e6f 6e63 6f6d 6269 6e61 7469
3527400  6f6e 616c 272c 5b27 4e6f 6e63 6f6d 6269 6e61 7469 6f6e 616c 272c 2761 7265 613a 272c 5f5d 293a 2d20 212e 0a70 726f 6365
3527460  7373 5f69 7465 6d28 7379 6e6f 7073 7973 2c20 274e 6574 272c 205b 274e 6574 272c 2027 496e 7465 7263 6f6e 6e65 6374 272c
3527540  2027 6172 6561 3a27 2c20 5f5d 293a 2d20 212e 0a70 726f 6365 7373 5f69 7465 6d28 7379 6e6f 7073 7973 2c20 2754 6f74 616c
3527620  272c 205b 2754 6f74 616c 272c 2027 6172 6561 3a27 2c20 5f5d 293a 2d20 212e 0a70 726f 6365 7373 5f69 7465 6d28 7379 6e6f
3527700  7073 7973 2c20 2770 6f72 7473 3a27 2c20 5b27 706f 7274 733a 272c 205f 5d29 3a2d 2021 2e0a 7072 6f63 6573 735f 6974 656d
3527760  2873 796e 6f70 7379 732c 2027 6e65 7473 3a27 2c20 5b27 6e65 7473 3a27 2c20 5f5d 293a 2d20 212e 0a70 726f 6365 7373 5f69
3530040  7465 6d28 7379 6e6f 7073 7973 2c20 2752 6570 6f72 7427 2c20 5b27 5265 706f 7274 272c 2027 3a27 2c20 5f5d 293a 2d20 212e
3530120  0a70 726f 6365 7373 5f69 7465 6d28 7379 6e6f 7073 7973 2c20 2744 6573 6967 6e27 2c20 5b27 4465 7369 676e 272c 2027 3a27
3530200  2c20 5f5d 293a 2d20 212e 0a0a 2525 0a25 2520 466f 7220 4453 500a 2525 0a70 726f 6365 7373 5f69 7465 6d28 6473 702c 2027
3530260  4255 5345 5327 2c20 5b27 4255 5345 5327 2c20 5f5d 2920 3a2d 2021 2e0a 7072 6f63 6573 735f 6974 656d 2864 7370 2c20 274d
3530340  554c 5449 504c 4558 4552 5327 2c20 5b27 4d55 4c54 4950 4c45 5845 5253 272c 205f 5d29 203a 2d20 212e 0a70 726f 6365 7373
3530420  5f69 7465 6d28 6473 702c 2027 4d55 4c54 4950 4c45 5845 5227 2c20 5b27 4d55 4c54 4950 4c45 5845 5227 2c20 2749 4e50 5554
3530500  5327 2c20 5f5d 2920 3a2d 2021 2e0a 7072 6f63 6573 735f 6974 656d 2864 7370 2c20 2752 4547 4953 5445 5253 3a27 2c20 5b27
3530560  5245 4749 5354 4552 533a 272c 2027 544f 5441 4c27 2c20 5f5d 2920 3a2d 2021 2e0a 7072 6f63 6573 735f 6974 656d 2864 7370
3530640  2c20 2743 4f4e 4e45 4354 494f 4e53 272c 205b 2743 4f4e 4e45 4354 494f 4e53 272c 205f 5d29 203a 2d20 212e 0a0a 2525 0a25
3530720  2520 466f 7220 6c76 6572 0a25 250a 7072 6f63 6573 735f 6974 656d 286c 7665 722c 2027 4741 5445 5327 2c20 5b27 4741 5445
3531000  5327 2c20 2755 5345 443a 272c 205f 5d29 2e0a 7072 6f63 6573 735f 6974 656d 286c 7665 722c 2027 4d41 5849 4d55 4d27 2c20
3531060  5b27 4d41 5849 4d55 4d27 2c20 2750 494e 5327 2c20 2750 4552 272c 2027 4e45 543a 272c 205f 5d29 2e0a 7072 6f63 6573 735f
3531140  6974 656d 286c 7665 722c 2027 4156 4552 4147 4527 2c20 5b27 4156 4552 4147 4527 2c20 2750 494e 5327 2c20 2750 4552 272c
3531220  2027 4e45 543a 272c 205f 5d29 2e0a 7072 6f63 6573 735f 6974 656d 286c 7665 722c 2027 494e 5055 5427 2c20 5b27 494e 5055
3531300  5427 2c20 2750 494e 5327 2c20 2728 4558 434c 5544 494e 4727 2c20 2742 4944 4952 4543 5449 4f4e 414c 272c 0a20 2020 2020
3531360  2020 2020 2020 2020 2020 2020 2020 2020 2020 2020 2020 2020 2750 494e 5329 3a27 2c20 5f2c 205f 5d29 2e0a 7072 6f63 6573
3531440  735f 6974 656d 286c 7665 722c 2027 4f55 5450 5554 272c 205b 274f 5554 5055 5427 2c20 2750 494e 5327 2c20 2728 4558 434c
3531520  5544 494e 4727 2c20 2742 4944 4952 4543 5449 4f4e 414c 272c 0a20 2020 2020 2020 2020 2020 2020 2020 2020 2020 2020 2020
3531600  2020 2020 2020 2027 5049 4e53 293a 272c 205f 2c20 5f5d 292e 0a70 726f 6365 7373 5f69 7465 6d28 6c76 6572 2c20 2750 4144
3531660  272c 205b 2750 4144 272c 2027 4c4f 4341 5449 4f4e 5327 2c20 2755 5345 4427 2c20 2746 4f52 272c 0a09 2020 2020 2020 2020
3531740  2020 2020 2020 2020 2020 2027 4249 4449 5245 4354 494f 4e41 4c27 2c20 2750 494e 533a 272c 205f 2c20 5f5d 292e 0a70 726f
3532020  6365 7373 5f69 7465 6d28 6c76 6572 2c20 2742 4944 4952 4543 5449 4f4e 414c 272c 205b 2742 4944 4952 4543 5449 4f4e 414c
3532100  272c 2027 5049 4e53 3a27 2c20 5f2c 205f 5d29 2e0a 0a25 250a 2525 2049 676e 6f72 6520 7265 7374 0a25 250a 7072 6f63 6573
3532160  735f 6974 656d 285f 2c20 5f2c 2069 676e 6f72 6529 3a2d 2021 2e09 0909 2520 6967 6e6f 7265 2072 6573 740a 0a25 2525 2525
3532240  2525 2525 2525 2525 2525 2525 2525 2525 2525 2525 2525 2525 2525 2525 2525 2525 2525 2525 2525 2525 2525 2525 2525 2525
3532320  2525 2525 2525 2525 2525 2525 2525 2525 2525 2525 2525 2525 250a 2525 2054 6865 2066 6f6c 6c6f 7769 6e67 2070 7265 6469
3532400  6361 7465 7320 7370 6563 6966 7920 686f 7720 746f 2069 6e74 6572 7072 6574 2074 6865 7365 206c 696e 6573 2e0a 2525 0a25
3532460  2520 436f 6d6d 6f6e 2066 6f72 2061 6c6c 0a25 250a 7072 6f63 6573 735f 6461 7461 285f 2c20 5f2c 205b 5d29 2e09 0909 2520
3532540  646f 6e65 2077 6974 6820 7468 6520 6669 6c65 210a 7072 6f63 6573 735f 6461 7461 285f 2c20 5f2c 2069 676e 6f72 6529 203a
3532620  2d20 2020 2020 2020 2020 2020 2520 6967 6e6f 7265 2074 6869 7320 7069 6563 6520 6f66 2064 6174 610a 0921 2c66 6169 6c2e
3532700  0a25 250a 2525 2046 6f72 2043 6969 7073 697a 6572 0a25 250a 7072 6f63 6573 735f 6461 7461 2863 6869 7073 697a 6572 2c20
3532760  5f2c 2044 6174 6129 203a 2d0a 0964 6573 6967 6e5f 7369 7a65 5f66 726f 6d5f 6461 7461 2853 697a 6558 2c20 5369 7a65 592c
3533040  2055 6e69 7473 2c20 4461 7461 292c 0a09 7075 7464 625f 6375 7272 656e 7428 6368 6970 7369 7a65 725f 7265 706f 7274 2c20
3533120  5b53 697a 6558 2c20 5369 7a65 592c 2055 6e69 7473 5d29 2c0a 0921 2c66 6169 6c2e 0a25 250a 2525 2046 6f72 2053 796e 6f70
3533200  7379 730a 2525 0a70 726f 6365 7373 5f64 6174 6128 7379 6e6f 7073 7973 2c20 5f2c 2044 6174 6129 203a 2d0a 0969 6e66 6f5f
3533260  6672 6f6d 5f64 6174 6128 7379 6e6f 7073 7973 2c20 5479 7065 2c20 5661 6c75 652c 2044 6174 6129 2c0a 0970 7574 6462 5f63
```

```
3533340  7572 7265 6e74 2873 796e 6f70 7379 735f 7265 706f 7274 2c20 5b54 7970 652c 2056 616c 7565 5d29 2c0a 0921 2c66 6169 6c2e
3533420  0a25 250a 2525 2946 6f72 2044 5350 0a25 250a 7072 6f63 6573 735f 6461 7461 2864 7370 2c20 5f2c 2044 6174 6129 203a 2d0a
3533500  0969 6e66 6f5f 6672 6f6d 5f64 6174 6128 6473 702c 2054 7970 652c 204e 756d 6265 722c 2044 6174 6129 2c0a 096e 756d 6265
3533560  7228 4e75 6d62 6572 292c 0a09 7075 7464 625f 6375 7272 656e 7428 6473 705f 7265 706f 7274 2c20 5b54 7970 652c 204e 756d
3533640  6265 725d 292c 0a09 212c 6661 696c 2e0a 2525 0a25 2520 466f 7220 6c76 6572 0a25 2520 0a70 726f 6365 7373 5f64 6174 6128
3533720  6c76 6572 2c20 5f2c 2044 6174 6129 203a 2d0a 0969 6e66 6f5f 6672 6f6d 5f64 6174 6128 6c76 6572 2c20 5479 7065 2c20 4e75
3534000  6d62 6572 2c20 4461 7461 292c 0a09 6e75 6d62 6572 284e 756d 6265 7229 2c0a 0970 7574 6462 5f63 7572 7265 6e74 286c 7665
3534060  725f 7265 706f 7274 2c20 5b54 7970 652c 204e 756d 6265 725d 292c 0a09 212c 6661 696c 2e0a 0a25 250a 2525 2047 656e 6572
3534140  6963 0a25 2520 0a25 7072 6f63 6573 735f 6461 7461 2850 726f 6772 6161 2c20 5f2c 2044 6174 6129 203a 2d0a 2509 7075 7464
3534220  625f 6375 7272 656e 7428 5072 6f67 7261 6d2c 2044 6174 6129 2c0a 2509 212c 6661 696c 2e0a 0a25 2525 2525 2525 2525 2525
3534300  2525 2525 2525 2525 2525 2525 2525 2525 2525 2525 2525 2525 2525 2525 2525 2525 2525 2525 2525 2525 2525 2525 2525 2525
3534360  2525 2525 2525 2525 2525 2525 2525 2525 2525 250a 2525 2525 2041 7579 696c 6c69 6172 7920 7072 6564 6963 6174 6573 2064
3534440  6566 696e 6564 2066 6f72 2063 6f6e 7665 6e69 656e 6365 2e0a 0a25 2525 2520 666f 7220 6368 6970 7369 7a65 720a 6465 7369
3534520  676e 5f73 697a 655f 6672 6f6d 5f64 6174 6128 5369 7a65 582c 2053 697a 6559 2c20 556e 6974 732c 0a09 0920 2020 2020 205b
3534600  2745 7374 696d 6174 6564 272c 6675 6e63 7469 6f6e 2c73 697a 652c 5369 7a65 582c 556e 6974 732c 5f2c 5369 7a65 592c 5f5d
3534660  292e 0a0a 2525 2525 2066 6f72 2073 796e 6f70 7379 730a 696e 666f 5f66 726f 6d5f 6461 7461 2873 796e 6f70 7379 732c 2063
3534740  6f6d 6269 6e61 7469 6f6e 616c 5f61 7265 612c 2041 7265 612c 205b 2743 6f6d 6269 6e61 7469 6f6e 616c 272c 2027 6172 6561
3535020  3a27 2c20 4172 6561 5d29 2e0a 696e 666f 5f66 726f 6d5f 6461 7461 2873 796e 6f70 7379 732c 206e 6f6e 636f 6d62 696e 6174
3535100  696f 6e61 6c5f 6172 6561 2c41 7265 612c 5b27 4e6f 6e63 6f6d 6269 6e61 7469 6f6e 616c 272c 2761 7265 613a 272c 2041 7265
3535160  615d 292e 0a69 6e66 6f5f 6672 6f6d 5f64 6174 6128 7379 6e6f 7073 7973 2c20 6e65 745f 696e 7465 7263 6f6e 6e65 6374 5f61
3535240  7265 612c 4172 6561 2c5b 274e 6574 272c 2749 6e74 6572 636f 6e6e 6563 7427 2c27 6172 6561 3a27 2c41 7265 615d 292e 0a69
3535320  6e66 6f5f 6672 6f6d 5f64 6174 6128 7379 6e6f 7073 7973 2c20 746f 7461 6c5f 6172 6561 2c20 4172 6561 2c20 5b27 546f 7461
3535400  6c27 2c20 2761 7265 613a 272c 2041 7265 615d 292e 0a69 6e66 6f5f 6672 6f6d 5f64 6174 6128 7379 6e6f 7073 7973 2c20 706f
3535460  7274 732c 204e 756d 6265 722c 205b 2770 6f72 7473 3a27 2c20 4e75 6d62 6572 5d29 2e0a 696e 666f 5f66 726f 6d5f 6461 7461
3535540  2873 796e 6f70 7379 732c 206e 6574 732c 204e 756d 6265 722c 205b 276e 6574 733a 272c 204e 756d 6265 725d 292e 0a69 6e66
3535620  6f5f 6672 6f6d 5f64 6174 6128 7379 6e6f 7073 7973 2c20 7265 706f 7274 2c20 5479 7065 2c20 5b27 5265 706f 7274 272c 2027
3535700  3a27 2c20 5479 7065 5d29 2e0a 696e 666f 5f66 726f 6d5f 6461 7461 2873 796e 6f70 7379 732c 2064 6573 6967 6e2c 204e 616d
3535760  652c 205b 2744 6573 6967 6e27 2c20 273a 272c 204e 616d 655d 292e 0a0a 2525 2525 2066 6f72 2064 7370 0a69 6e66 6f5f 6672
3536040  6f6d 5f64 6174 6128 6473 702c 2062 7573 6573 2c20 4e75 6d62 6572 2c20 5b27 4255 5345 5327 2c20 4e75 6d62 6572 5d29 2e0a
3536120  696e 666f 5f66 726f 6d5f 6461 7461 2864 7370 2c20 6d75 7865 732c 204e 756d 6265 722c 205b 274d 554c 5449 504c 4558 4552
3536200  5327 2c20 4e75 6d62 6572 5d29 2e0a 696e 666f 5f66 726f 6d5f 6461 7461 2864 7370 2c20 6d75 785f 696e 7075 7473 2c20 4e75
3536260  6d62 6572 2c20 5b27 4d55 4c54 4950 4c45 5845 5227 2c20 2749 4e50 5554 5327 2c20 4e75 6d62 6572 5d29 2e0a 696e 666f 5f66
3536340  726f 6d5f 6461 7461 2864 7370 2c20 7265 6769 7374 6572 732c 204e 756d 6265 722c 205b 2752 4547 4953 5445 5253 3a27 2c20
3536420  2754 4f54 414c 272c 204e 756d 6265 725d 292e 0a69 6e66 6f5f 6672 6f6d 5f64 6174 6128 6473 702c 2063 6f6e 6e65 6374 696f
3536500  6e73 2c20 4e75 6d62 6572 2c20 5b27 434f 4e4e 4543 5449 4f4e 5327 2c20 4e75 6d62 6572 5d29 2e0a 0a25 2525 2520 666f 7220
3536560  6c76 6572 0a69 6e66 6f5f 6672 6f6d 5f64 6174 6128 6c76 6572 2c20 6761 7465 735f 7573 6564 2c20 4e75 6d62 6572 2c20 5b27
3536640  4741 5445 5327 2c20 2755 5345 443a 272c 204e 756d 6265 725d 292e 0a69 6e66 6f5f 6672 6f6d 5f64 6174 6128 6c76 6572 2c20
3536720  6176 6572 6167 655f 7069 6e73 5f70 6572 5f6e 6574 2c20 4e75 6d62 6572 2c0a 095b 2741 5645 5241 4745 272c 2027 5049 4e53
3537000  272c 2027 5045 5227 2c20 274e 4554 3a27 2c20 4e75 6d62 6572 5d29 2e0a 696e 666f 5f66 726f 6d5f 6461 7461 286c 7665 722c
3537060  206d 6178 5f70 696e 735f 7065 725f 6e65 742c 204e 756d 6265 722c 0a09 5b27 4d41 5849 4d55 4d27 2c20 2750 494e 5327 2c20
3537140  2750 4552 272c 2027 4e45 543a 272c 204e 756d 6265 725d 292e 0a69 6e66 6f5f 6672 6f6d 5f64 6174 6128 6c76 6572 2c20 696e
3537220  7075 745f 7069 6e73 2c20 4e75 6d62 6572 2c0a 095b 2749 4e50 5554 272c 2027 5049 4e53 272c 2027 2845 5843 4c55 4449 4e47
3537300  272c 2742 4944 4952 4543 5449 4f4e 414c 272c 2750 494e 5329 3a27 2c5f 2c4e 756d 6265 725d 292e 0a69 6e66 6f5f 6672 6f6d
3537360  5f64 6174 6128 6c76 6572 2c20 6f75 7470 7574 5f70 696e 732c 204e 756d 6265 722c 0a09 5b27 4f55 5450 5554 272c 2027 5049
3537440  4e53 272c 2027 2845 5843 4c55 4449 4e47 272c 2742 4944 4952 4543 5449 4f4e 414c 272c 2750 494e 5329 3a27 2c5f 2c4e 756d
3537520  6265 725d 292e 0a69 6e66 6f5f 6672 6f6d 5f64 6174 6128 6c76 6572 2c20 6269 6469 7265 6374 696f 6e61 6c5f 7069 6e73 2c20
3537600  4e75 6d62 6572 2c0a 095b 2742 4944 4952 4543 5449 4f4e 414c 272c 2027 5049 4e53 3a27 2c20 5f2c 204e 756d 6265 725d 292e
3537660  0a25 696e 666f 5f66 726f 6d5f 6461 7461 286c 7665 722c 2070 6164 5f6c 6f63 6174 696f 6e73 2c20 4e75 6d62 6572 2c0a 2509
3537740  5b27 5041 4427 2c27 4c4f 4341 5449 4f4e 5327 2c27 5553 4544 272c 2746 4f52 272c 2742 4944 4952 4543 5449 4f4e 414c 272c
3540020  2750 494e 533a 272c 205f 2c20 4e75 6d62 6572 5d29 2e0a 2525 2525 2525 2525 2525 2525 2525 2525 2525 2525 2525 2525 2525
3540100  2525 2525 2525 2525 2525 2525 2525 2525 2525 2525 2525 2525 2525 2525 2525 2525 2525 2525 2525 2525 2525 2525 2525 2525
3540160  2525 2525 0a61 7279 2062 7920 332e 3520 6174 2074 6865 206c 6174 6573 742e 0909 7c0a 252d 2d2d 2d2d 2d2d 2d2d 2d2d 2d2d
3540240  2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d 2d2d
3540320  2d2d 2d2d 2d2d 2d2d 2d2d 2b0a 0a6d 7573 745f 6265 5f61 746f 6d28 4172 672c 204e 2c20 476f 616c 2920 3a2d 0a09 6d75 7374
3540400  5f62 6528 6174 6f6d 2c20 4172 672c 204e 2c20 476f 616c 292e 0a0a 6d75 7374 5f62 655f 6265 7477 6565 6e28 4c2c 2055 2c20
```

| | | | | | | | | | | | | | | | | | | | | | | | | |
|---|---|---|---|---|---|---|---|---|---|---|---|---|---|---|---|---|---|---|---|---|---|---|---|---|
| 3540460 | 4172 | 672c | 204e | 2c20 | 476f | 616c | 2920 | 3a2d | 0a09 | 6d75 | 7374 | 5f62 | 6528 | 6265 | 7477 | 6565 | 6e28 | 4c2c | 5529 | 2c20 | 4172 | 672c | 204e | 2c20 |
| 3540540 | 476f | 616c | 292e | 0a0a | 6d75 | 7374 | 5f62 | 655f | 6361 | 6c6c | 6162 | 6c65 | 2841 | 7267 | 2c20 | 4e2c | 2047 | 6f61 | 6c29 | 203a | 2d0a | 096d | 7573 | 745f |
| 3540620 | 6265 | 2863 | 616c | 6c61 | 626c | 652c | 2041 | 7267 | 2c20 | 4e2c | 2047 | 6f61 | 6c29 | 2e0a | 0a6d | 7573 | 745f | 6265 | 5f63 | 6d61 | 7273 | 2841 | 7267 | 2c20 |
| 3540700 | 4e2c | 2047 | 6f61 | 6c29 | 203a | 2d0a | 096d | 7573 | 745f | 6265 | 2863 | 6861 | 7273 | 2c20 | 4172 | 672c | 204e | 2c20 | 476f | 616c | 292e | 0a0a | 6d75 | 7374 |
| 3540760 | 5f62 | 655f | 636f | 6d70 | 6f75 | 6e64 | 2841 | 7267 | 2c20 | 4e2c | 2047 | 6f61 | 6c29 | 203a | 2d0a | 096d | 7573 | 745f | 6265 | 2863 | 6f6d | 706f | 756e | 642c |
| 3541040 | 2041 | 7267 | 2c20 | 4e2c | 2047 | 6f61 | 6c29 | 2e0a | 0a6d | 7573 | 745f | 6265 | 5f63 | 6f6e | 7374 | 616e | 7428 | 4172 | 672c | 204e | 2c20 | 476f | 616c | 2920 |
| 3541120 | 3a2d | 0a09 | 6d75 | 7374 | 5f62 | 6528 | 636f | 6e73 | 7461 | 6e74 | 2c20 | 4172 | 672c | 204e | 2c20 | 476f | 616c | 292e | 0a0a | 6d75 | 7374 | 5f62 | 655f | 6772 |
| 3541200 | 6f75 | 6e64 | 2841 | 7267 | 2c20 | 4e2c | 2047 | 6f61 | 6c29 | 203a | 2d0a | 096d | 7573 | 745f | 6265 | 2867 | 726f | 756e | 642c | 2041 | 7267 | 2c20 | 4e2c | 2047 |
| 3541260 | 6f61 | 6c29 | 2e0a | 0a6d | 7573 | 745f | 6265 | 5f69 | 6e74 | 6567 | 6572 | 2841 | 7267 | 2c20 | 4e2c | 2047 | 6f61 | 6c29 | 203a | 2d0a | 096d | 7573 | 745f | 6265 |
| 3541340 | 2869 | 6e74 | 6567 | 6572 | 2c20 | 4172 | 672c | 204e | 2c20 | 476f | 616c | 292e | 0a0a | 6d75 | 7374 | 5f62 | 655f | 6e6f | 6e6e | 6567 | 2841 | 7267 | 2c20 | 4e2c |
| 3541420 | 2047 | 6f61 | 6c29 | 203a | 2d0a | 096d | 7573 | 745f | 6265 | 286e | 6f6e | 6e65 | 672c | 2041 | 7267 | 2c20 | 4e2c | 2047 | 6f61 | 6c29 | 2e0a | 0a6d | 7573 | 745f |
| 3541500 | 6265 | 5f6e | 6f6e | 7661 | 7228 | 4172 | 672c | 204e | 2c20 | 476f | 616c | 2920 | 3a2d | 0a09 | 6d75 | 7374 | 5f62 | 6528 | 6e6f | 6e76 | 6172 | 2c20 | 4172 | 672c |
| 3541560 | 204e | 2c20 | 476f | 616c | 292e | 0a0a | 6d75 | 7374 | 5f62 | 655f | 6e75 | 6d62 | 6572 | 2841 | 7267 | 2c20 | 4e2c | 2047 | 6f61 | 6c29 | 203a | 2d0a | 096d | 7573 |
| 3541640 | 745f | 6265 | 286e | 756d | 6265 | 722c | 2041 | 7267 | 2c20 | 4e2c | 2047 | 6f61 | 6c29 | 2e0a | 0a6d | 7573 | 745f | 6265 | 5f6f | 6e65 | 6f66 | 2841 | 7267 | 2c20 |
| 3541720 | 4c69 | 7374 | 2c20 | 4e2c | 2047 | 6f61 | 6c29 | 203a | 2d0a | 096d | 7573 | 745f | 6265 | 286f | 6e65 | 6f66 | 284c | 6973 | 7429 | 2c20 | 4172 | 672c | 204e | 2c20 |
| 3542000 | 476f | 616c | 292e | 0a0a | 6d75 | 7374 | 5f62 | 655f | 7072 | 6f70 | 6572 | 5f6c | 6973 | 7428 | 4172 | 672c | 204e | 2c20 | 476f | 616c | 2920 | 3a2d | 0a09 | 6d75 |
| 3542060 | 7374 | 5f62 | 6528 | 7072 | 6f70 | 6572 | 5f6c | 6973 | 742c | 2041 | 7267 | 2c20 | 4e2c | 2047 | 6f61 | 6c29 | 2e0a | 0a6d | 7573 | 745f | 6265 | 5f73 | 796d | 626f |
| 3542140 | 6c28 | 4172 | 672c | 204e | 2c20 | 476f | 616c | 2920 | 3a2d | 0a09 | 6d75 | 7374 | 5f62 | 6528 | 7379 | 6d62 | 6f6c | 2c20 | 4172 | 672c | 204e | 2c20 | 476f | 616c |
| 3542220 | 292e | 0a0a | 6d75 | 7374 | 5f62 | 655f | 7661 | 7228 | 4172 | 672c | 204e | 2c20 | 476f | 616c | 2920 | 3a2d | 0a09 | 6d75 | 7374 | 5f62 | 6528 | 7661 | 722c | 2041 |
| 3542300 | 7267 | 2c20 | 4e2c | 2047 | 6f61 | 6c29 | 2e0a | 0a0a | 0a25 | 2020 | 206d | 7573 | 745f | 6265 | 2854 | 7970 | 652c | 2054 | 6572 | 6d2c | 2041 | 7267 | 4e6f | 2c20 |
| 3542360 | 476f | 616c | 290a | 2520 | 2020 | 6368 | 6563 | 6b73 | 2077 | 6865 | 7468 | 6572 | 2074 | 6865 | 2054 | 6572 | 6d20 | 5265 | 6c6f | 6e67 | 7320 | 746f | 2074 | 6865 |
| 3542440 | 2069 | 6e64 | 6963 | 6174 | 6564 | 2054 | 7970 | 6520 | 2879 | 6f75 | 2077 | 696c | 6c20 | 6f66 | 7465 | 6e0a | 2520 | 2020 | 6361 | 6c6c | 206d | 7573 | 745f | 6265 |
| 3542520 | 2f32 | 2077 | 6865 | 6e20 | 796f | 7520 | 6b6e | 6f77 | 2074 | 6861 | 7420 | 7468 | 6973 | 2074 | 6573 | 7420 | 7769 | 6c6c | 2066 | 6169 | 6c2c | 2062 | 7574 | 2079 |
| 3542600 | 6f75 | 2063 | 616e | 0a25 | 2020 | 206c | 6561 | 7665 | 2069 | 7420 | 746f | 206d | 7573 | 745f | 6265 | 2f34 | 2074 | 6f20 | 6368 | 6563 | 6b20 | 666f | 7220 | 796f |
| 3542660 | 7529 | 2e20 | 2049 | 6620 | 6974 | 2069 | 736e | 2774 | 2c20 | 7468 | 6572 | 6520 | 6172 | 6520 | 7477 | 6f0a | 2520 | 2020 | 6361 | 7365 | 733a | 2020 | 7468 | 6520 |
| 3542740 | 5465 | 726d | 206d | 6179 | 206e | 6f74 | 2062 | 6520 | 696e | 7374 | 616e | 7469 | 6174 | 6564 | 2065 | 6e6f | 7567 | 6820 | 746f | 2074 | 656c | 6c20 | 7965 | 742c |
| 3543020 | 2069 | 6e20 | 7768 | 6963 | 680a | 2520 | 2020 | 6361 | 7365 | 2061 | 6e20 | 494e | 5354 | 414e | 5449 | 4154 | 494f | 4e20 | 4641 | 554c | 5420 | 7769 | 6c6c | 2062 |
| 3543100 | 6520 | 7265 | 706f | 7274 | 6564 | 2c20 | 6f72 | 2074 | 6865 | 2054 | 6572 | 6d20 | 6d61 | 7920 | 6265 | 0a25 | 2020 | 2064 | 6566 | 696e | 6974 | 656c | 7920 | 6e6f |
| 3543160 | 7420 | 6f66 | 2074 | 6865 | 2074 | 7970 | 652c | 2069 | 6e20 | 7768 | 6963 | 6820 | 6361 | 7365 | 2061 | 2054 | 5950 | 4520 | 4552 | 524f | 5220 | 6973 | 2072 | 6570 |
| 3543240 | 6f72 | 7465 | 642e | 0a25 | 2020 | 2059 | 6f75 | 2073 | 686f | 756c | 6420 | 7573 | 6520 | 7468 | 6973 | 2069 | 6e20 | 636f | 6d6d | 616e | 6473 | 2077 | 6974 | 6820 |
| 3543320 | 7369 | 6465 | 2065 | 6666 | 6563 | 7473 | 2c20 | 616e | 6420 | 7368 | 6f75 | 6c64 | 2061 | 7272 | 616e | 6765 | 0a25 | 2020 | 2074 | 6861 | 7420 | 6966 | 2074 | 6869 |
| 3543400 | 7320 | 7072 | 6564 | 6963 | 6174 | 6520 | 646f | 6573 | 206e | 6f74 | 2073 | 7563 | 6365 | 6564 | 2074 | 6865 | 2073 | 6964 | 6520 | 6566 | 6665 | 6374 | 2873 | 2920 |
| 3543460 | 7769 | 6c6c | 206e | 6f74 | 0a25 | 2020 | 2074 | 616b | 6520 | 706c | 6163 | 652e | 0a0a | 6d75 | 7374 | 5f62 | 6528 | 5479 | 7065 | 2c20 | 5465 | 726d | 2c20 | 4172 |
| 3543540 | 674e | 6f2c | 2047 | 6f61 | 6c29 | 203a | 2d0a | 0974 | 7970 | 655f | 6368 | 6563 | 6b28 | 5479 | 7065 | 2c20 | 5465 | 726d | 2c20 | 4172 | b464 | ac0a | 0016 | 29d4 |
| 3543620 | 0000 | 0000 | 0000 | 70af | b328 | 0ddf | 0016 | 2a08 | 0000 | 0000 | 0016 | b024 | 000f | 9bc4 | 0000 | 70e7 | b328 | 0ddf | 0016 | 2a3c | 0000 | 0000 | 0011 | 50f8 |
| 3543700 | 0000 | 0000 | 0016 | b03c | 0016 | b04c | b464 | 0007 | 0016 | 2a70 | 0000 | 0000 | b464 | 0028 | 0016 | 2aa4 | 0000 | 0000 | b464 | 102a | 0016 | 2ad8 | 0000 | 0000 |
| 3543760 | b464 | 0db5 | 0016 | 2b0c | 0000 | 0000 | 0002 | 5144 | 0000 | 0ddf | 000b | 554e | 4958 | 2064 | 6563 | 6f64 | 6500 | 0007 | 000d | 554e | 4958 | 2070 | 726f | 7065 |
| 3544040 | 7274 | 7900 | 0013 | 554e | 4958 | 2070 | 6572 | 6d69 | 7373 | 696f | 6e20 | 6269 | 7400 | 0007 | 0023 | 2240 | 2823 | 2938 | 392f | 3038 | 2f32 | 3920 | 6469 | 7265 |
| 3544120 | 6374 | 6f72 | 792e | 706c | 2020 | 2020 | 3333 | 2e32 | 2200 | 0007 | 0016 | 1e00 | 0100 | 2def | 0000 | 20e7 | 0000 | 0004 | 0016 | b16c | 0016 | b16c | 0001 | 007d |
| 3544200 | 0000 | 0000 | 000c | 7072 | 6f63 | 6573 | 735f | 6974 | 6564 | 0000 | 0000 | 0028 | 0016 | 437c | b27c | b66c | 0000 | 102f | 7fff | ffff | 0017 | ee1c | 0200 | 0db5 |
| 3544260 | 0100 | 32b5 | 0000 | 20e7 | 0000 | 315f | 0000 | 20e7 | b328 | b13d | 0016 | b130 | 0000 | 0000 | 000e | 4518 | 0000 | 0000 | 0016 | b14c | 0016 | b15c | 2cac | b152 |
| 3544340 | 0002 | 438a | 2ca0 | 0007 | 0000 | 0000 | 0000 | 0001 | 0016 | 4b6c | 0016 | 4b6c | 0002 | 438a | 0016 | 4ba0 | 000b | 6c6f | 7765 | 725f | 7570 | 7065 | 7200 | 0000 |
| 3544420 | 0005 | 6b6e | 6f77 | 6e00 | 0017 | a168 | 0016 | b1b0 | 0016 | 71c8 | 0000 | 0000 | 0012 | c2c4 | 0600 | 787f | 0000 | 20e7 | 0000 | 0018 | 0016 | 3524 | 0016 | 367c |
| 3544500 | 0001 | 007d | 0000 | 0000 | 2aa8 | 7b24 | 0017 | 7b20 | 0016 | 7800 | 2aa8 | 491c | 0016 | 4918 | 0016 | 7798 | 2c78 | 0028 | 0002 | 438a | 3724 | 0018 | 373c | 001c |
| 3544560 | 427c | 0000 | 0004 | 0003 | 4268 | 0000 | 0002 | 0003 | 239c | 0000 | 0016 | b1c8 | 000a | 6269 | 6e2f | 726d | 202d | 6620 | 0017 | a08c | 000c | 7072 | 6f63 | 6573 |
| 3544640 | 735f | 6461 | 7461 | 0068 | 0016 | b1b8 | 0500 | 787f | 0000 | 20e7 | 0000 | 0014 | 0016 | 37a0 | 0016 | 37a0 | 0001 | 007d | 0000 | 0000 | 2aa8 | 7e40 | 0017 | 7e3c |
| 3544720 | 0016 | 74e4 | 2aa8 | 7e4c | 0016 | b258 | 0016 | 7498 | 2c78 | 0024 | 0002 | 438a | 3724 | 0018 | 427c | 0000 | 0004 | 0003 | 4268 | 0000 | 0002 | 0003 | 239c | 0000 |
| 3545000 | 0016 | b248 | 000c | 7265 | 6164 | 5f72 | 6573 | 756c | 7473 | 0000 | 0006 | 5049 | 4e53 | 293a | 0016 | b2b0 | 0007 | 4156 | 4552 | 4147 | 4500 | 0000 | 2c78 | 0028 |
| 3545060 | 0002 | 438a | 3724 | 0018 | 373c | 001c | 427c | 0000 | 0002 | 0003 | 4268 | 0000 | 0004 | 0003 | 239c | 0000 | 0016 | b1c8 | 27f0 | 000e | 0016 | 9404 | 54a8 | 3050 |
| 3545140 | c5a8 | 0000 | 0016 | b4a0 | 0400 | 788f | 0000 | 20e7 | 0000 | 0010 | 0016 | b76c | 0016 | b76c | 0001 | 007d | 0000 | 0000 | 2b24 | 7e88 | 0002 | 438a | 0017 | a2b8 |
| 3545220 | 2aa8 | 7e94 | 0017 | 7e90 | 0016 | 733c | 2c78 | 0024 | 0002 | 438a | 3724 | 0018 | 427c | 0000 | 0002 | 0003 | 4268 | 0000 | 0004 | 0003 | 239c | 0000 | 0016 | b248 |
| 3545300 | 0006 | 5144 | 7061 | 7274 | 0000 | 0ddf | 0012 | c4ac | 0600 | 78a7 | 0000 | 20e7 | 0000 | 0018 | 0016 | bf34 | 0016 | bf34 | 0021 | 0000 | 0000 | 0000 | 0006 | 5144 |
| 3545360 | 7465 | 7374 | 0016 | 855e | 0012 | c51c | 0700 | 78af | 0000 | 20e7 | 0000 | 001c | 0016 | bf60 | 0016 | bf60 | 0021 | 0000 | 0000 | 0000 | 0006 | 5144 | 696e | 6974 |
| 3545440 | 0016 | b3b6 | 0012 | c570 | 0500 | 78b7 | 0000 | 20e7 | 0000 | 0014 | 0017 | 7a80 | 0017 | 7a80 | 0021 | 0000 | 0000 | 0000 | 0016 | b238 | 0100 | 787f | 0000 | 20e7 |
| 3545520 | 0000 | 0004 | 0016 | b438 | 0016 | b438 | 0001 | 007d | 0000 | 0000 | 2b24 | 7eac | 0002 | 438a | 0016 | 730c | 0006 | 5144 | 6e65 | 7874 | 0016 | b40e | 0006 | 5265 |

```
3545600  706f 7274 0000 0000 0012 c5c0 0300 78bf 0000 20e7 0000 000c 0017 7aa4 0017 7aa4 0021 0000 0000 0000 2cac b43e 0002 438a
3545660  2ca0 b446 0000 0000 0000 0001 0016 389c 0016 4b8c 0016 38a6 0016 4c98 0007 626f 6f6c 6561 6e00 6179 000d 7273 6820 6f73
3545740  6173 3220 2d6e 2000 2c78 0028 0002 438a 4224 0018 0000 315f 427c 0000 0000 78c7 4268 0000 0000 20e7 239c 0000 0016 b4b0
3546020  0012 c370 0500 788f 0000 20e7 0000 0014 0016 3a58 0016 3a58 0001 007d 0000 0000 0006 706f 7274 733a 0000 0000 2c78 001c
3546100  0002 438a 3724 0018 3244 41fc 0000 20e7 239c 0000 0016 b4b0 000b 2263 6420 6070 7764 603b 2000 0000 2c78 0028 0002 438a
3546160  4224 0018 0000 315f 427c 0000 0000 78c7 4268 0000 0000 2247 239c 0000 0016 b4b0 2aa8 7ee8 0017 7ee4 0016 7244 2c78 001c
3546240  0002 438a 3724 0018 3244 41fc 0000 2247 239c 0000 0016 b4b0 0006 5144 7072 6f70 0000 0007 0000 7a17 b328 0000 0016 6df4
3546320  0000 0000 0012 c740 0600 78df 0000 20e7 0000 0018 0016 bf8c 0016 bf8c 0021 0000 0000 0000 0012 c318 0400 7887 0000 20e7
3546400  0000 0010 0016 b5b4 0016 b5b4 0001 007d 0000 0000 0000 7cef b328 0000 0016 4dc8 0000 0000 2cac b59d 0002 438a 2ca0 b5a9
3546460  0000 001c 0000 0007 0016 3bf4 0016 b6d8 0002 438a 0016 b689 001a 43ac 28c4 0020 0016 3c30 4e1c 0000 0000 253f a874 aab4
3546540  0010 9fa0 a890 9188 aefc 7220 0016 3c00 0000 0000 0003 7768 6f00 0007 0005 6772 6f75 7000 0005 6f74 6865 7200 0012 c3c8
3546620  0500 7897 0000 20e7 0000 0014 0016 b700 0016 b720 0001 0074 0000 0000 000c 6463 5f73 6865 6c6c 202d 6620 0000 0016 3cd0
3546700  0000 0000 0006 5144 6e61 6d65 0016 b649 0012 c8e0 0400 78ff 0000 20e7 0000 0010 0017 7ac8 0017 7ac8 0021 0000 0000 0000
3546760  0016 3ca4 0016 b5fc 0016 b681 0000 0000 0000 0000 0016 b6e4 0016 3c3c 0016 b6d1 0000 0000 0016 b5e8 28c4 0028 0016 b6d8
3547040  4e1c 0000 0000 70af 370c 0018 3600 43c0 0200 710f 6c48 0018 6bc8 22bc 0015 60b4 0016 b6b4 0016 b64c 2954 0028 0002 438a
3547120  4e1c 0000 0000 70df 370c 0018 3600 43c0 0200 710f 6c48 0018 6bc8 22bc 0015 6194 27f0 0020 0016 b720 5818 6bc8 6784 4a30
3547200  0018 a874 a858 9f24 aab4 0000 a260 2edc 2954 000e 0002 438a 4348 0018 228c 0007 0008 7265 6164 6162 6c65 0021 27f0 000c
3547260  0017 a0ec 54a8 228c 27f0 0022 0016 b79c 4e1c 0000 0000 7907 4ec4 0000 0000 78c7 4f18 0000 0000 0023 228c 0ddf 2cac 0007
3547340  0002 438a 2ca0 03df 0000 007c 0000 001a 0016 b748 0016 bc70 0002 438a 0016 3da0 0008 7772 6974 6162 6c65 0082 28c4 0022
3547420  0016 b7d8 4e1c 0000 0000 790f 4ec4 0000 0000 78c7 4f18 0000 0000 0013 228c 0007 0005 6172 6561 3a00 000a 6578 6563 7574
3547500  6162 6c65 0000 0007 28c4 0020 0016.b818 4e1c 0000 0000 7917 519c 0000 0000 2247 0000 78c7 0000 000b 000b 6163 6365 7373
3547560  5f64 6174 6500 b824 000a 7365 6172 6368 6162 6c65 0000 0ddf 28c4 0020 0016 b848 4e1c 0000 0000 791f 519c 0000 0000 20e7
3547640  0000 78c7 0000 000b 000b 6163 6365 7373 5f74 696d 6500 b82a 28c4 0022 0016 b88c 4e1c 0000 0000 7927 4ec4 0000 0000 70df
3547720  4f18 0000 0000 0053 228c 0007 28c4 0020 0016 b9a0 4e1c 0000 0000 7957 519c 0000 0000 2247 0000 78c7 0000 00db 28c4 0022
3550000  0016 b8c0 4e1c 0000 0000 792f 4ec4 0000 0000 70af 4f18 0000 0000 0053 228c 0007 000b 6d6f 6469 6679 5f74 696d 6500 b8a2
3550060  28c4 0022 0016 b8f4 4e1c 0000 0000 7937 4ec4 0000 0000 70df 4f18 0000 0000 005b 228c 0007 000b 6d6f 6469 6679 5f64 6174
3550140  6500 b8dd 28c4 0022 0016 b928 4e1c 0000 0000 793f 4ec4 0000 0000 70af 4f18 0000 0000 005b 228c 0007 000b 6372 6561 7465
3550220  5f74 696d 6500 0007 28c4 0022 0016 b95c 4e1c 0000 0000 7947 4ec4 0000 0000 70df 4f18 0000 0000 0063 228c 0007 000b 6372
3550300  6561 7465 5f64 6174 6500 b84a 28c4 0022 0016 b86c 4e1c 0000 0000 794f 4ec4 0000 0000 70af 4f18 0000 0000 0063 228c b7d2
3550360  000b 7365 745f 7573 6572 5f69 6400 0ddf 000c 7365 745f 6772 6f75 705f 6964 0007 28c4 0020 0016 b9cc 4e1c 0000 0000 795f
3550440  519c 0000 0000 2247 0000 78c7 0000 00d3 0009 7361 7665 5f74 6578 7400 28c4 0020 0016 b9fc 4e1c 0000 0000 7967 519c 0000
3550520  0000 2247 0000 78c7 0000 00cb 000c 7768 6f5f 6361 6e5f 7265 6164 00be 28c4 0022 0016 ba30 4e1c 0000 0000 796f 4ec4 0000
3550600  0000 78e7 4f18 0000 0000 0093 228c 0007 000d 7768 6f5f 6361 6e5f 7772 6974 6500 28c4 0022 0016 ba68 4e1c 0000 0000 7977
3550660  4ec4 0000 0000 78e7 4f18 0000 0000 008b 228c 0007 000f 7768 6f5f 6361 6e5f 6578 6563 7574 6500 ba4e 28c4 0020 0016 ba9c
3550740  4e1c 0000 0000 797f 519c 0000 0000 2247 0000 78e7 0000 0083 000e 7768 6f5f 6361 6e5f 7365 6172 6368 0016 ba7e 28c4 0020
3551020  0016 bacc 4e1c 0000 0000 7987 519c 0000 0000 20e7 0000 78e7 0000 0083 000d 6f77 6e65 725f 7573 6572 5f69 6400 28c4 0022
3551100  0016 bb04 4e1c 0000 0000 798f 4ec4 0000 0000 253f 4f18 0000 0000 0143 228c bad5 000f 6f77 6e65 725f 7573 6572 5f6e 616d
3551160  6500 0007 28c4 0022 0016 bb3c 4e1c 0000 0000 7997 4ec4 0000 0000 3287 4f18 0000 0000 0143 228c 0ddf 000e 6f77 6e65 725f
3551240  6772 6f75 705f 6964 0016 bb1e 28c4 0022 0016 bb74 4e1c 0000 0000 799f 4ec4 0000 0000 253f 4f18 0000 0000 014b 228c 0007
3551320  0010 6f77 6e65 725f 6772 6f75 705f 6e61 6d65 0007 28c4 0022 0016 bba8 4e1c 0000 0000 79a7 4ec4 0000 0000 78ef 4f18 0000
3551400  0000 014b 228c bb81 000d 6f6e 6c79 5f6f 6e65 5f6c 696e 6b00 28c4 0020 0016 bbdc 4e1c 0000 0000 79af 519c 0000 0000 2247
3551460  0000 78c7 0000 0153 000f 6e75 6d62 6572 5f6f 665f 6c69 6e6b 7300 0ddf 28c4 0020 0016 bc0c 4e1c 0000 0000 79b7 519c 0000
3551540  0000 2247 0000 253f 0000 015b 000d 7369 7a65 5f69 6e5f 6279 7465 7300 28c4 0020 0016 bc40 4e1c 0000 0000 79bf 519c 0000
3551620  0000 2247 0000 253f 0000 0163 000e 7369 7a65 5f69 6e5f 626c 6f63 6b73 0000 0007 28c4 0020 0016 bc70 4e1c 0000 0000 79c7
3551700  519c 0000 0000 2247 0000 253f 0000 016b 000a 626c 6f63 6b5f 7369 7a65 0000 0007 2954 0020 0002 438a 4e1c 0000 0000 79cf
3551760  519c 0000 0000 2247 0000 253f 0000 0173 000b 6469 7265 6374 6f72 792e 6f00 0ddf 0006 5144 6865 7265 0016 bc91 0015 8630
3552040  0200 22df 0000 20e7 0000 0008 000a 18f0 000a 18f0 0000 0000 0000 0000 0000 7a17 b328 bcb9 0016 6d9c 0000 0000 0015 8698
3552120  0000 0024 2ca0 0007 0000 0000 0000 0001 0016 3e20 0016 3e20 0002 438a 0016 b5d8 0015 b214 0200 22d7 0000 20e7 0000 0008
3552200  000a 18f0 000a 18f0 0000 0000 0000 0000 000c 6469 7265 6374 6f72 792e 706c 0000 0016 bccc 0016 bd38 0010 f030 0000 0000
3552260  0016 bce0 0000 0024 2ca0 bd31 0000 001c 0000 0007 0016 3eac 0016 4194 0002 438a 0016 bd80 0017 ef20 000d 1810 0000 0008
3552340  0000 783f b328 4010 0016 425c 0000 0000 0017 7f48 0000 0038 0000 0000 0016 bdb1 0016 3f84 0016 4010 0016 3eb8 0016 bda1
3552420  0016 bdac 0000 0008 0016 bdb4 0000 0008 0017 7b14 0000 0008 0016 bd00 0300 22d7 0000 20e7 0000 000c 000a 18f0 000a 18f0
3552500  0000 0000 0000 0000 0005 5150 5f4c 3700 b464 7b24 0016 4290 0017.a810 000e 7265 6164 5f66 726f 6d5f 6669 6c65 0000 0000
3552560  0000 002c 0015 8784 b27c b66c 0000 104b 7fff ffff 0016 be34 0200 0db5 0200 22ed 0000 78b7 00b6 0163 0000 315f 0000 002c
3552640  0016 be08 b27c b66c 0000 104c 7fff ffff 0016 be60 0200 0db5 0200 22ed 0000 78bf 00b6 12a3 0000 315f 0000 002c 0016 be34
```

| | | | | | | | | | | | | | | | | | | | | | | | | |
|---|---|---|---|---|---|---|---|---|---|---|---|---|---|---|---|---|---|---|---|---|---|---|---|---|
| 3552720 | b27c | b66c | 0000 | 104d | 7fff | ffff | 0016 | be8c | 0200 | 0db5 | 0200 | 22ed | 0000 | 78a7 | 00b6 | 1d23 | 0000 | 315f | 0000 | 002c | 0016 | be60 | b27c | b66c |
| 3553000 | 0000 | 104e | 7fff | ffff | 0016 | beb8 | 0200 | 0db5 | 0200 | 22ed | 0000 | 78af | 00b6 | 2523 | 0000 | 315f | 0000 | 002c | 0016 | be8c | b27c | b66c | 0000 | 104f |
| 3553060 | 7fff | ffff | 0016 | bee4 | 0200 | 0db5 | 0200 | 22ed | 0000 | 79ff | 00b6 | 3183 | 0000 | 315f | 0000 | 002c | 0016 | beb8 | b27c | b66c | 0000 | 1050 | 7fff | ffff |
| 3553140 | 0016 | bf10 | 0200 | 0db5 | 0200 | 22ed | 0000 | 78df | 00b6 | 3503 | 0000 | 315f | 0000 | 002c | 0016 | bee4 | b27c | b66c | 0000 | 1051 | 7fff | ffff | 000b | d48d |
| 3553220 | 0200 | 0db5 | 0200 | 22ed | 0000 | 79df | 00b6 | 0003 | 0000 | 315f | 2c78 | 002c | 0002 | 438a | 7ae4 | 0008 | 808c | 0018 | 7ed4 | 813c | 8130 | 7ed4 | 7ebc | 0000 |
| 3553300 | 0016 | c3a4 | 0014 | 8924 | 001c | 8b44 | 8b80 | 228c | 2c78 | 002c | 0002 | 438a | 7ae4 | 0004 | 7ed4 | 808c | 0018 | 8148 | 813c | 8068 | 805c | 7c28 | 0016 | c4a4 |
| 3553360 | 0018 | 8924 | 0020 | 8b94 | 001c | 228c | 2c78 | 002a | 0002 | 438a | 7ae4 | 0008 | 7ed4 | 7ed4 | 813c | 8068 | 805c | 7c28 | 0016 | c6a0 | 0014 | 8924 | 001c | 8900 |
| 3553440 | 891c | 0018 | 228c | 0007 | 0000 | 0038 | 0014 | 4d38 | b27c | b66c | 0000 | 1052 | 7fff | ffff | 000b | d625 | 0200 | 0db5 | 0300 | 22e5 | 0000 | 0001 | 0000 | 79ef |
| 3553520 | 0000 | 0007 | 0000 | 0007 | 0000 | 20e7 | 0000 | 315f | 2c78 | 0010 | 0002 | 438a | 239c | 0000 | 0016 | 8df8 | 9de3 | bfa0 | 1100 | 05dd | ba02 | 2010 | 4000 | 0b6b |
| 3553600 | 9010 | 001d | 8090 | 0008 | 1280 | 0003 | 1300 | 05dc | ba02 | 6150 | 81c7 | e008 | 91e8 | 001d | 9de3 | bfa0 | 1100 | 05dc | d002 | 2138 | 8090 | 0008 | 0280 | 0004 |
| 3553660 | 1100 | 05dc | 4000 | 02b9 | d002 | 2138 | 4000 | 0f79 | 9010 | 0018 | 1500 | 05dc | d022 | a138 | d402 | a138 | 8090 | 000a | 3280 | 0005 | 1900 | 05dd | 1700 | 0295 |
| 3553740 | 1080 | 0034 | f002 | e1c8 | ae03 | 2010 | ba10 | 0018 | b010 | 0017 | f84f | 4000 | ba07 | 6001 | f82e | 0000 | 8090 | 001c | 12bf | fffc | b006 | 2001 | b026 | 2001 |
| 3554020 | 80a6 | 0017 | 2280 | 000b | 1300 | 05dc | de4e | 3fff | 80a3 | e02f | 2280 | 0007 | 1300 | 05dc | a210 | 202f | e22e | 0000 | b0c6 | 2001 | c02e | 0000 | 1300 | 05dc |
| 3554100 | 9212 | 6152 | 4000 | 01e5 | 9010 | 0017 | 8090 | 0008 | 3280 | 0004 | 8090 | 0019 | b010 | 0017 | 8090 | 0019 | 2500 | 05de | 0280 | 000b | f024 | a014 | 1300 | 05dc |
| 3554160 | 9212 | 6140 | 4000 | 01d9 | 9010 | 0019 | 8090 | 0008 | 2280 | 0005 | b010 | 2000 | 1080 | 0003 | b010 | 0019 | b010 | 2000 | 2700 | 05dc | f024 | e13c | 2900 | 05de |
| 3554240 | f435 | 2018 | 2b00 | 05de | f635 | 601c | b010 | 2000 | 81c7 | e008 | 81e8 | 0000 | 9de3 | bfa0 | fa4e | 4000 | b206 | 6001 | 8090 | 001d | 2280 | 0039 | f04e | 0000 |
| 3554320 | 80a7 | 602a | 3280 | 0027 | 80a7 | 603f | fa4e | 4000 | 8090 | 001d | 2280 | 0013 | 8090 | 001d | 80a7 | 602a | 2280 | 000b | b206 | 6001 | 80a7 | 603f | 3280 | 000d |
| 3554400 | 8090 | 001d | fa4e | 0000 | b006 | 2001 | 8090 | 001d | 2280 | 002b | b010 | 2000 | b206 | 6001 | fa4e | 4000 | 8090 | 001d | 32bf | fff3 | 80a7 | 602a | 8090 | 001d |
| 3554460 | 3280 | 0005 | d84e | 0000 | 1080 | 0021 | b010 | 2001 | 184e | 0000 | 8090 | 000c | 2280 | 001d | b010 | 2000 | 9210 | 0019 | 7fff | ffd9 | 9010 | 0018 | 8090 | 0008 |
| 3554540 | 3280 | 0017 | b010 | 2001 | 10bf | fff6 | b006 | 2001 | 3280 | 0009 | da4e | 0000 | fa4e | 0000 | b006 | 2001 | 8090 | 001d | 32bf | ffcf | fa4e | 4000 | 1080 | 000c |
| 3554620 | b010 | 2000 | b006 | 2001 | 80a3 | 4014 | 22bf | ffc9 | fa4e | 4000 | 1080 | 0006 | b010 | 2000 | 8090 | 0018 | 3280 | 0003 | b010 | 2000 | b010 | 2001 | 81c7 | e008 |
| 3554700 | 81e8 | 0000 | 9de3 | bf60 | 1100 | 05dc | b402 | 2144 | f426 | 4000 | 1300 | 05dd | 1500 | 05dc | ac02 | a148 | ae02 | 6010 | f426 | 0000 | 1100 | 05dc | 4000 | 0f29 |
| 3554760 | d002 | 2138 | 8090 | 0008 | 2280 | 0041 | 2100 | 05dc | d602 | 2004 | 8090 | 000b | 22bf | fff9 | 1100 | 05dc | ba02 | 200c | 9010 | 001d | 4000 | 0170 | 9210 | 001a |
| 3555040 | 8090 | 0008 | 22bf | fff2 | 1100 | 05dc | 9210 | 0016 | 4000 | 016a | 9010 | 001d | 8090 | 0008 | 22bf | ffec | 1100 | 05dc | 1b00 | 05dc | da03 | 613c | 809c | 000d |
| 3555120 | 2280 | 000a | 1f00 | 05de | 1300 | 05dc | d202 | 613c | 7fff | ff96 | 9010 | 001d | 8090 | 0008 | 22bf | ffe0 | 1100 | 05dc | 1f00 | 05de | f803 | e014 | f64f | 4000 |
| 3555200 | ba07 | 6001 | f62f | 0000 | 8090 | 001b | 12bf | fffc | b807 | 2001 | 9010 | 0017 | 7ffd | 949c | 9207 | bfc0 | 8090 | 0008 | 32bf | ffd2 | 1100 | 05dc | e617 | bfc8 |
| 3555260 | 1100 | 05de | e012 | 2018 | d012 | 2018 | a60c | c010 | 80a4 | c008 | 32bf | ffca | 1100 | 05dc | d617 | bfc8 | 1300 | 05de | d212 | 601c | 808a | c009 | 32bf | ffc4 |
| 3555340 | 1100 | 05dc | 1b00 | 05de | da03 | 6014 | ba10 | 2000 | da26 | 0000 | 1080 | 0006 | ee26 | 4000 | 4000 | 01e7 | d004 | 2138 | c024 | 2138 | ba10 | 2001 | 81c7 | e008 |
| 3555420 | 91e8 | 001d | 9de3 | bf60 | 1100 | 05dc | ac02 | 2144 | ec26 | c000 | ec26 | 0000 | 9010 | 001c | 7ffd | 9477 | 9207 | bfc0 | 8090 | 0008 | 1280 | 000b | 0100 | 0000 |
| 3555500 | d617 | bfc8 | 960a | c019 | 80a2 | c019 | 1280 | 0006 | 0100 | 0000 | de17 | bfc8 | 808b | c01a | 2280 | 0004 | b210 | 001c | 1080 | 0028 | b210 | 2001 | f44e | 4000 |
| 3555560 | 2300 | 05dd | aa04 | 6010 | 8090 | 001a | ba10 | 001c | ae10 | 2000 | b206 | 6001 | 0280 | 000d | b810 | 0015 | 80a6 | a02f | 3280 | 0005 | f42f | 0000 | ba10 | 0019 |
| 3555640 | ae10 | 001c | f42f | 0000 | f44e | 4000 | b807 | 2001 | 8090 | 001a | 12bf | fff7 | b206 | 6001 | 9210 | 0016 | 4000 | 0106 | 9010 | 001d | 8090 | 0008 | 0280 | 0010 |
| 3555720 | 1300 | 05dc | 9212 | 6148 | 4000 | 0100 | 9010 | 001d | 8090 | 0008 | 0280 | 000a | 8090 | 0017 | 2280 | 0005 | b210 | 2000 | c02d | c000 | ea26 | 0000 | b210 | 2000 |
| 3556000 | fa26 | c000 | 81c7 | e008 | 91e8 | 0019 | 10bf | fffe | b210 | 2001 | 9de3 | bf60 | f627 | a050 | 1100 | 05dc | b602 | 2144 | f427 | a04c | 8090 | 0019 | 0280 | 000f |
| 3556060 | f627 | 4000 | 1300 | 05dc | 9212 | 6140 | 4000 | 00e7 | 9010 | 0019 | 8090 | 0008 | 2280 | 0009 | 9210 | 001b | 9210 | 0019 | 7fff | ff19 | 9010 | 001c | 8090 | 0008 |
| 3556140 | 2280 | 004e | b210 | 2001 | 9210 | 001b | 4000 | 00db | 9010 | 001c | 8090 | 0008 | 2280 | 0048 | b210 | 2001 | 1300 | 05dc | 9212 | 6148 | 4000 | 00d4 | 9010 | 001c |
| 3556220 | 8090 | 0008 | 2280 | 0041 | b210 | 2001 | 1300 | 05dd | b402 | 6010 | b210 | 001a | b610 | 0018 | f04e | c000 | b606 | e001 | f02e | 4000 | 8090 | 0018 | 12bf | fffc |
| 3556300 | b206 | 6001 | b226 | 6001 | 80a6 | 401a | 2280 | 000b | 1300 | 05dc | d64e | 7fff | 80a2 | e02f | 2280 | 0007 | 1300 | 05dc | 9a10 | 202f | da2e | 4000 | b206 | 6001 |
| 3556360 | c02e | 4000 | 1300 | 05dc | 9212 | 6155 | 4000 | 00b7 | 9010 | 001a | 8090 | 0008 | 1280 | 000c | f64f | 0000 | b210 | 001a | 8090 | 001b | 0280 | 000c | b807 | 2001 |
| 3556440 | 80a6 | e02f | 2280 | 001d | b210 | 2001 | f62e | 4000 | b206 | 6001 | f64f | 0000 | b807 | 2001 | 8090 | 001b | 32bf | fff9 | 80a6 | e02f | 9010 | 001a | 9207 | bfc0 |
| 3556520 | 7ffd | 93ee | c02e | 4000 | 8090 | 0008 | 3280 | 000f | b210 | 2001 | e617 | bfc8 | ee07 | a04c | a60c | c017 | 80a4 | c017 | 3280 | 0009 | b210 | 2001 | d017 | bfc8 |
| 3556600 | ec07 | a050 | 808a | 0016 | 3280 | 0004 | b210 | 2001 | f427 | 4000 | b210 | 2000 | 81c7 | e008 | 91e8 | 0019 | 9de3 | bfa0 | 1100 | 05dc | 9012 | 2144 | 8090 | 0019 |
| 3556660 | 0280 | 000b | d026 | 8000 | 4000 | 0155 | 9010 | 0018 | b010 | 0008 | 8090 | 0018 | 3280 | 000e | f006 | 0000 | 1300 | 0295 | 1080 | 000d | f402 | 61c8 | 4000 | 0542 |
| 3556740 | 9010 | 0018 | b010 | 0008 | 8090 | 0018 | 3280 | 0005 | f006 | 0000 | 1700 | 0295 | 1080 | 0004 | f402 | e1c8 | f026 | 8000 | b410 | 2000 | 81c7 | e008 | 91e8 | 001a |
| 3557020 | 9de3 | bf60 | c026 | c000 | c027 | 0000 | 9207 | bfc0 | 7ffd | 93ba | 9010 | 0018 | 8090 | 0008 | 2280 | 0005 | d24e | 4000 | 1100 | 0295 | 1080 | 0066 | f402 | 21c8 |
| 3557100 | 80a2 | 6064 | 3280 | 0009 | f24e | 4000 | d617 | bfc8 | 1b00 | 0010 | 808a | c00d | 3280 | 0010 | 80a6 | a00a | 1080 | 005c | b410 | 2014 | 80a6 | 6066 | 1280 | 0009 |
| 3557160 | 0100 | 0000 | e217 | bfc8 | 2700 | 0020 | 808c | 4013 | 3280 | 0006 | 80a6 | a00a | 1080 | 0052 | b410 | 2015 | 1080 | 0050 | b410 | 2016 | 3680 | 000b | 80a6 | a010 |
| 3557240 | 9210 | 001a | 7ffd | 9337 | 9007 | bfc0 | 8090 | 0008 | 3280 | 0003 | a810 | 2000 | a810 | 2001 | 1080 | 003e | b410 | 0014 | 3680 | 0011 | 80a6 | a020 | 80a6 | a00a |
| 3557320 | 0280 | 0008 | 80a6 | a00b | 0280 | 0008 | 80a6 | a00c | 0280 | 0008 | 0100 | 0000 | 1080 | 003a | b410 | 2016 | 1080 | 0031 | f407 | bfd8 | 1080 | 002f | f407 | bfe0 |
| 3557400 | 1080 | 002d | f407 | bfe8 | 3680 | 001c | b426 | a028 | aa26 | a010 | f417 | bfc8 | b536 | 8015 | 1080 | 0026 | b40e | a049 | 1080 | 0024 | f457 | bfcc | 1080 | 0022 |
| 3557460 | f457 | bfce | de57 | bfca | 80a3 | e001 | 3280 | 0003 | a210 | 2000 | a210 | 2001 | 1080 | 001b | b410 | 0011 | 1080 | 0019 | f457 | bfca | 1080 | 0017 | f407 | bfd4 |
| 3557540 | 1080 | 0015 | f407 | bff4 | 1080 | 0013 | f407 | bff0 | 1080 | 0018 | b410 | 2016 | 80a6 | a006 | 18bf | fffd | b52e | a002 | 1300 | 05b2 | 9212 | 6028 | d006 | 8009 |
| 3557620 | 81c2 | 0000 | 0100 | 0000 | 0016 | c7b4 | 0016 | c7bc | 0016 | c7c4 | 0016 | c7e0 | 0016 | c7e8 | 0016 | c7f0 | 0016 | c7f8 | 2b00 | 003f | a93e | a010 | aa15 | 63ff |
| 3557700 | b40e | 8015 | e826 | c000 | f427 | 0000 | b410 | 2000 | 81c7 | e008 | 91e8 | 001a | 9de3 | bfc0 | 808e | 2003 | 0280 | 000d | b68e | 6003 | f84e | 0000 | fa4e | 4000 |
| 3557760 | b006 | 2001 | 80a7 | 001d | 1280 | 00a4 | b206 | 6001 | 8090 | 001c | 12bf | fff7 | 808e | 2003 | 1080 | 008a | b010 | 2000 | 2d1f | bfbf | ac15 | a2ff | 2f20 | 4040 |

| | | | | | | | | | | | | | | | | | | | | | | | | |
|---|---|---|---|---|---|---|---|---|---|---|---|---|---|---|---|---|---|---|---|---|---|---|---|---|
| 3560040 | ae15 | e100 | 213f | c000 | 2300 | 3fc0 | a534 | 6008 | 0280 | 0067 | 80a6 | e002 | 0280 | 0045 | 80a6 | e001 | fa0e | 4000 | b206 | 6001 | 0280 | 001f | bb2f | 6018 |
| 3560120 | b026 | 0019 | f606 | 4000 | f806 | 0019 | b206 | 6004 | a936 | e008 | ba15 | 0011 | 80a7 | 0011 | 0280 | 0003 | a607 | 0016 | 3080 | 0072 | a61c | c01c | a60c | c017 |
| 3560200 | 30a4 | c017 | 22bf | fff4 | bb2e | e018 | 808f | 0010 | 3080 | 006b | 1280 | 0003 | 808f | 0011 | 3080 | 0066 | 1280 | 0003 | 808f | 0012 | 3080 | 0063 | 1280 | 0003 |
| 3560260 | 808f | 20ff | 3080 | 0060 | 12bf | ffe7 | bb2e | e018 | 3080 | 005d | a810 | 0000 | e016 | 4000 | b206 | 6002 | a92d | 2008 | ba17 | 4014 | b026 | 0019 | f606 | 4000 |
| 3560340 | f806 | 0019 | b206 | 6004 | a936 | e018 | ba15 | 001d | 80a7 | 001d | 0280 | 0003 | a607 | 0016 | 3080 | 0050 | a61c | c01c | a60c | c017 | 80a4 | c017 | 22bf | fff4 |
| 3560420 | bb2e | e008 | 808f | 0010 | 3080 | 0049 | 1280 | 0003 | 808f | 0011 | 3080 | 0044 | 1280 | 0003 | 808f | 0012 | 3080 | 0041 | 1280 | 0003 | 808f | 20ff | 3080 | 003e |
| 3560500 | 12bf | ffe7 | bb2e | e008 | 3080 | 003b | fa16 | 4000 | b206 | 6002 | bb2f | 6010 | b026 | 0019 | f606 | 4000 | f806 | 4018 | b206 | 6004 | a936 | e010 | ba15 | 001d |
| 3560560 | 80a7 | 001d | 0280 | 0003 | a607 | 0016 | 3080 | 0030 | a61c | c01c | a60c | c017 | 80a4 | c017 | 22bf | fff4 | bb2e | e010 | 808f | 0010 | 3080 | 0029 | 1280 | 0003 |
| 3560640 | 808f | 0011 | 3080 | 0024 | 1280 | 0003 | 808f | 0012 | 3080 | 0021 | 1280 | 0003 | 808f | 20ff | 3080 | 001e | 12bf | ffe7 | bb2e | e010 | 3080 | 001b | b026 | 0019 |
| 3560720 | fa06 | 4000 | f806 | 4018 | 80a7 | 001d | b206 | 6004 | 0280 | 0003 | a607 | 0016 | 3080 | 0015 | a61c | c01c | a60c | c017 | 80a4 | c017 | 22bf | fff7 | fa06 | 4000 |
| 3561000 | 808f | 0010 | 3080 | 000e | 1280 | 0003 | 808f | 0011 | 3080 | 0009 | 1280 | 0003 | 808f | 0012 | 3080 | 0006 | 1280 | 0003 | 808f | 20ff | 3080 | 0003 | 32bf | ffea |
| 3561060 | fa06 | 4000 | 81c7 | e008 | 91e8 | 0000 | a937 | 2018 | ab37 | 6018 | b0a5 | 0015 | 1280 | 0011 | 808d | 20ff | 02bf | fff9 | a937 | 2010 | ab37 | 6010 | b0a5 | 0015 |
| 3561140 | 1280 | 000b | 808d | 20ff | 02bf | fff3 | a937 | 2008 | ab37 | 6008 | b0a5 | 0015 | 1280 | 0005 | 808d | 20ff | 02bf | ffed | 0100 | 0000 | b027 | 001d | 81c7 | e008 |
| 3561220 | 91ee | 0000 | 0000 | 0000 | 9de3 | bfa0 | fa06 | 0000 | 9010 | 3fff | d026 | 0000 | c026 | 2004 | 7ffa | a88f | d006 | 2014 | 7ffa | a88d | 9010 | 0018 | 7ffd | 948f |
| 3561300 | 9010 | 001d | 81c7 | e008 | 91e8 | 0008 | 0000 | 0000 | 9de3 | bfa0 | 1100 | 05de | d002 | 2020 | 8090 | 0008 | 3280 | 0008 | 1500 | 05de | 9210 | 2760 | 7ffa | a9c3 |
| 3561360 | 9010 | 2001 | 1300 | 05de | d022 | 6020 | 1500 | 05de | f002 | a020 | 81c7 | e008 | 81e8 | 0000 | 9de3 | bb98 | 7fff | fff0 | 0100 | 0000 | 4000 | 0056 | b810 | 0008 |
| 3561440 | 8090 | 001c | 2280 | 0024 | ba10 | 2000 | d007 | 2014 | 8090 | 0008 | 2280 | 0020 | ba10 | 2000 | ba07 | bbff | d407 | 2014 | 9210 | 2400 | 4000 | 1198 | 9010 | 001d |
| 3561520 | 8090 | 0008 | 0280 | 0015 | 0100 | 0000 | 7fff | 9409 | 9010 | 001d | 9210 | 0008 | 4000 | 0123 | 9010 | 001d | 8090 | 0008 | 02bf | fff3 | d027 | bbf8 | 9410 | 0018 |
| 3561600 | 9010 | 001d | 4000 | 02fc | 9207 | bbf8 | 8090 | 0008 | 22bf | ffed | d407 | 2014 | 4000 | 005a | 0100 | 0000 | 1080 | 0005 | fa07 | bbf8 | 4000 | 0056 | 0100 | 0000 |
| 3561660 | ba10 | 2000 | 81c7 | e008 | 91e8 | 001d | 9de3 | bb98 | 7fff | ffc4 | 0100 | 0000 | b810 | 0008 | 8090 | 001c | 2280 | 0026 | ba10 | 2000 | 4000 | 0026 | 0100 | 0000 |
| 3561740 | d007 | 2014 | 8090 | 0008 | 2280 | 0020 | ba10 | 2000 | ba07 | bbff | d407 | 2014 | 9210 | 2400 | 4000 | 116b | 9010 | 001d | 8090 | 0008 | 0280 | 0015 | 0100 | 0000 |
| 3562020 | 7fff | 93dc | 9010 | 001d | 9210 | 0008 | 4000 | 00f6 | 9010 | 001d | 8090 | 0008 | 02bf | fff3 | d027 | bbf8 | 9410 | 0018 | 9010 | 001d | 4000 | 028c | 9207 | bbf8 |
| 3562100 | 8090 | 0008 | 22bf | ffed | d407 | 2014 | 4000 | 002d | 0100 | 0000 | 1080 | 0005 | fa07 | bbf8 | 4000 | 0029 | 0100 | 0000 | ba10 | 2000 | 81c7 | e008 | 91e8 | 001d |
| 3562160 | 9de3 | bfa0 | 7fff | ff97 | 0100 | 0000 | ba10 | 0008 | 8090 | 001d | 0280 | 001d | 0100 | 0000 | d007 | 4000 | 8090 | 0008 | 3280 | 0006 | d207 | 6014 | 9210 | 2000 |
| 3562240 | 4000 | 1712 | 9010 | 001d | d207 | 6014 | 8090 | 0009 | 1280 | 0008 | 1300 | 05dc | 1100 | 05dc | 9012 | 2158 | 4000 | 127a | 9212 | 6168 | 1080 | 0004 | d027 | 6014 |
| 3562320 | 4000 | 120c | d007 | 6014 | d407 | 6018 | 8090 | 000a | 0280 | 0004 | 0100 | 0000 | 7ffa | a800 | d007 | 6018 | 4000 | 0114 | c027 | 6018 | 81c7 | e008 | 81e8 | 0000 |
| 3562400 | 9de3 | bfa0 | 7fff | ff73 | 0100 | 0000 | ba10 | 0008 | 8090 | 001d | 0280 | 0011 | 0100 | 0000 | d007 | 6014 | 8090 | 0008 | 2280 | 0006 | d207 | 6018 | 7fff | 920f |
| 3562460 | d007 | 6014 | c027 | 6014 | d207 | 6018 | 6090 | 0009 | 0280 | 0004 | 0100 | 0000 | 7ffa | a7e8 | d007 | 6018 | 4000 | 00fc | c027 | 6018 | 81c7 | e008 | 81e8 | 0000 |
| 3562540 | 9de3 | bb98 | ba07 | bbff | 9010 | 001d | 9210 | 2400 | 4000 | 110e | 9410 | 0018 | 8090 | 0008 | 2280 | 0008 | ba10 | 2000 | 7fff | 937f | 9010 | 001d | 9210 | 0008 |
| 3562620 | 4000 | 0099 | 9010 | 001d | ba10 | 0008 | 81c7 | e008 | 91e8 | 001d | d44a | 0000 | 8090 | 000a | 2280 | 0010 | da4a | 0000 | d84a | 0000 | 80a3 | 0009 | 2280 | 000c |
| 3562700 | da4a | 0000 | d64a | 0000 | 80a2 | e00a | 2280 | 0008 | da4a | 0000 | 9002 | 2001 | d44a | 0000 | 8090 | 000a | 32bf | fff6 | d84a | 0000 | da4a | 0000 | 80a3 | 600a |
| 3562760 | 3280 | 0004 | c24a | 0000 | 1080 | 0007 | c02a | 0000 | 8090 | 0001 | 0280 | 0004 | 0100 | 0000 | c02a | 0000 | 9002 | 2001 | 81c3 | e008 | 0100 | 0000 | 9de3 | bb98 |
| 3563040 | 7fff | ff2c | 0100 | 0000 | b810 | 0008 | 8090 | 001c | 3280 | 0004 | d007 | 0000 | 1080 | 006d | ba10 | 2000 | 8090 | 0008 | 3280 | 0006 | d207 | 2014 | 9210 | 2000 |
| 3563120 | 4000 | 16a6 | 9010 | 001c | d207 | 2014 | 8090 | 0009 | 3280 | 000d | d607 | 2018 | 1300 | 05dc | 1100 | 05dc | 9012 | 2158 | 4000 | 120d | 9212 | 616a | 8090 | 0008 |
| 3563200 | 1280 | 0004 | d027 | 2014 | 1080 | 0059 | ba10 | 2000 | d607 | 2018 | b607 | bbff | 8090 | 000b | 2280 | 0019 | d407 | 2014 | d007 | 2018 | d207 | 201c | 1500 | 05de |
| 3563260 | 4000 | 00ba | d402 | a024 | ba10 | 0008 | 7ffa | a78b | d007 | 2018 | 8090 | 001d | 2280 | 0049 | ba10 | 2000 | 4000 | 00f3 | 0100 | 0000 | 4000 | 00d8 | 9010 | 001d |
| 3563340 | 8090 | 0008 | 0280 | 0042 | 0100 | 0000 | d607 | 2018 | 8090 | 000b | 32bf | ffed | d007 | 2018 | d407 | 2014 | 9210 | 2400 | 4000 | 10a9 | 9010 | 001b | 8090 | 0008 |
| 3563420 | 2280 | 0037 | ba10 | 2000 | 7fff | 931a | 9010 | 001b | 9210 | 0008 | 4000 | 0034 | 9010 | 001b | ba10 | 0008 | 8070 | 001d | 3280 | 0024 | d04f | bbff | 1080 | 002c |
| 3563500 | ba10 | 2000 | d007 | 4000 | 1300 | 05dc | 7fff | fe23 | 9212 | 616c | 8090 | 0008 | 1280 | 0009 | 0100 | 0000 | 4000 | 00f2 | 0100 | 0000 | 4000 | 015f | 9010 | 001d |
| 3563560 | 1900 | 05de | 10bf | ffde | d023 | 2024 | 4000 | 015a | 9010 | 001d | 1300 | 05de | d022 | 6024 | d007 | 4000 | d202 | 6024 | 4000 | 0105 | 9002 | 2001 | ba10 | 0008 |
| 3563640 | 8090 | 001d | 22bf | ffd3 | d607 | 2018 | 10bf | ffcb | 0100 | 0000 | 4000 | 0134 | 9002 | 2001 | 10bf | ffcd | d607 | 2018 | 80a2 | 202b | 02bf | ffdf | 80a2 | 202d |
| 3563720 | 22bf | fff9 | d007 | 4000 | 4000 | 0098 | 9010 | 001d | 8090 | 0008 | 32bf | ffc3 | d607 | 2018 | 81c7 | e008 | 91e8 | 001d | 9de3 | bf98 | 7fff | feb6 | 0100 | 0000 |
| 3564000 | b810 | 0008 | 8090 | 001c | 3280 | 0004 | ba07 | 235c | 1080 | 004a | b010 | 2000 | 9410 | 0019 | 9210 | 0018 | 4000 | 0bec | 9010 | 001d | 9410 | 200a | b207 | 4019 |
| 3564060 | d42e | 4000 | c02e | 6001 | d64f | 4000 | b010 | 001d | 80a2 | e02b | 3280 | 0003 | 9a10 | 2000 | 9a10 | 2001 | b210 | 000d | 9210 | 203a | 9010 | 0018 | 7fff | ff52 |
| 3564140 | fa27 | 234c | d027 | 2350 | 7fff | ff4f | 9210 | 203a | b010 | 0008 | de4e | 0000 | 80a3 | e03a | 3280 | 0007 | 9410 | 200a | 8090 | 0019 | 3280 | 0004 | 9410 | 200a |
| 3564220 | 1080 | 002a | b010 | 2000 | 9010 | 0018 | 4000 | 0bdf | 9207 | bffc | f007 | bffc | ba10 | 0008 | e24e | 0000 | b006 | 2001 | 80a4 | 603a | 2280 | 0007 | fa27 | 2354 |
| 3564300 | 8090 | 0019 | 3280 | 0004 | fa27 | 2354 | 1080 | 001b | b010 | 2000 | b207 | 2028 | f227 | 2358 | 9210 | 200a | 7fff | ff31 | 9010 | 0018 | ec4e | 0000 | ba07 | 2344 |
| 3564360 | 8090 | 0016 | 2280 | 0010 | b007 | 234c | 80a6 | 401d | 3a80 | 0005 | 9210 | 202c | f026 | 4000 | b206 | 6004 | 9210 | 202c | 7fff | ff24 | 9010 | 0018 | b010 | 0008 |
| 3564440 | ec4e | 0000 | 8090 | 0016 | 32bf | fff6 | 80a6 | 401d | b007 | 234c | c026 | 4000 | 81c7 | e008 | 81e8 | 0000 | 9de3 | bfa0 | 1100 | 05de | f802 | 2020 | 8090 | 001c |
| 3564520 | 0280 | 0010 | 0100 | 0000 | fa07 | 2348 | 8090 | 001d | 2280 | 000b | ba10 | 2000 | 7ffa | a6e0 | d007 | 4000 | 7ffa | a6de | 9010 | 001d | fa07 | 6004 | 8090 | 001d |
| 3564600 | 12bf | fffa | 0100 | 0000 | ba10 | 2000 | c027 | 2348 | 81c7 | e008 | 91e8 | 001d | 9de3 | bfa0 | 1100 | 05de | d002 | 2020 | 8090 | 0008 | 3280 | 0004 | 9210 | 0019 |
| 3564660 | 1080 | 0020 | b410 | 2000 | 7fff | ff8f | 9010 | 0018 | b010 | 0008 | 8090 | 0018 | 3280 | 0004 | d206 | a004 | 1080 | 0018 | b410 | 2000 | 8090 | 0009 | 2280 | 000a |
| 3564740 | da06 | a00c | d406 | a004 | d44a | 8000 | 8090 | 000a | 2280 | 0005 | da06 | a00c | d806 | a004 | d826 | 2004 | da06 | a00c | 8090 | 000d | 2280 | 000a | b410 | 0018 |
| 3565020 | de06 | a00c | de03 | c000 | 8090 | 000f | 2280 | 0005 | b410 | 0018 | f406 | a00c | f426 | 200c | b410 | 0018 | 81c7 | e008 | 91e8 | 001a | 9de3 | bfa0 | 1100 | 05de |
| 3565100 | fa02 | 2020 | 8090 | 001d | 2280 | 0013 | ba10 | 2000 | f006 | 0000 | fa07 | 6348 | 8090 | 001d | 2280 | 000e | ba10 | 2000 | d007 | 4000 | 7fff | fd5c | 9210 | 0018 |

| | | | | | | | | | | | | | | | | | | | | | | | | |
|---|---|---|---|---|---|---|---|---|---|---|---|---|---|---|---|---|---|---|---|---|---|---|---|---|
| 3565160 | 8090 | 0008 | 3280 | 0004 | fa07 | 6004 | 1080 | 0006 | ba10 | 2001 | 8090 | 001d | 32bf | fff8 | d007 | 4000 | ba10 | 2000 | 81c7 | e008 | 91e8 | 001d | 9de3 | bf90 |
| 3565240 | 1100 | 05de | fa02 | 2020 | c027 | bffc | 8090 | 001d | 0280 | 001c | 9207 | 6018 | d223 | a05c | 9407 | 601c | d423 | a060 | d607 | 6024 | d407 | 6020 | d007 | 4000 |
| 3565320 | 1300 | 05dc | 9212 | 616e | 9a07 | bff8 | 4000 | 1707 | 9807 | bffc | 8090 | 0008 | 2280 | 0004 | d607 | 6020 | c027 | 6018 | d607 | 6020 | 8090 | 000b | 2280 | 0005 |
| 3565400 | d807 | bffc | 7ffa | a679 | d007 | 6020 | d807 | bffc | d827 | 6020 | da07 | bff8 | da27 | 6024 | ba10 | 2000 | 81c7 | e008 | 91e8 | 0011 | 9de3 | bf98 | 1100 | 05de |
| 3565460 | fa02 | 2020 | c027 | bffc | 8090 | 001d | 0280 | 0019 | 0100 | 0000 | d007 | 4000 | 1300 | 05dc | 9212 | 617b | 9807 | 6018 | 9407 | bffc | 9a07 | 601c | 4000 | 15b3 |
| 3565540 | 9607 | bff8 | 8090 | 0008 | 2280 | 0004 | d207 | 6020 | c027 | 6018 | d207 | 6020 | 8090 | 0009 | 2280 | 0005 | d407 | bffc | 7ffa | a659 | d007 | 6020 | d407 | bffc |
| 3565620 | d427 | 6020 | d607 | bff8 | d627 | 6024 | ba10 | 2000 | 81c7 | e008 | 91e8 | 0014 | 9de3 | bf98 | 1100 | 05de | fa02 | 2020 | 8090 | 001d | 2280 | 0031 | b210 | 2000 |
| 3565700 | 7fff | 91f0 | 9010 | 0018 | 9610 | 0008 | d007 | 4000 | 1300 | 05dc | 9212 | 6188 | 9410 | 0018 | 9807 | bffc | 4000 | 1899 | 9a07 | bff8 | 8090 | 0008 | 2280 | 0004 |
| 3565760 | d207 | bff8 | 1080 | 0022 | b210 | 2000 | 7fff | fefe | d007 | bffc | ba10 | 0008 | 7ffa | a638 | d007 | bffc | 8090 | 001d | 3280 | 0004 | d206 | 6004 | 1080 | 0018 |
| 3566040 | b210 | 2000 | 8090 | 0009 | 2280 | 000a | da06 | 600c | d406 | 6004 | d44a | 8000 | 8090 | 000a | 2280 | 0005 | da06 | 600c | d806 | 6004 | d827 | 6004 | da06 | 600c |
| 3566120 | 8090 | 000d | 2280 | 000a | b210 | 001d | de06 | 600c | de03 | c000 | 8090 | 000f | 2280 | 0005 | b210 | 001d | f206 | 600c | f227 | 600c | b210 | 001d | 81c7 | e008 |
| 3566200 | 91e8 | 0019 | 9de3 | bfa0 | 1100 | 05de | fa02 | 2020 | 8090 | 001d | 0280 | 0012 | 0100 | 0000 | 7ffa | a53c | 9010 | 2008 | b810 | 0008 | 7fff | 91b6 | 9010 | 0018 |
| 3566260 | 7ffa | a537 | 9002 | 2001 | b610 | 0008 | 9010 | 001b | 7fff | b240 | 9210 | 0018 | f627 | 0000 | d207 | 6348 | d227 | 2004 | f827 | 6348 | ba10 | 2000 | 81c7 | e008 |
| 3566340 | 91e8 | 001d | 9de3 | bc80 | 1100 | 05de | d002 | 2020 | ba10 | 2000 | 8090 | 0008 | 3280 | 0004 | 1300 | 05de | 1080 | 0058 | ba10 | 2000 | d202 | 6028 | 8090 | 0009 |
| 3566420 | 0280 | 001d | 1500 | 05de | d402 | a028 | b607 | bffc | f802 | a00c | da07 | 0000 | 8090 | 000d | 2280 | 000e | 2300 | 05de | 80a7 | 401b | 3a80 | 000b | 2300 | 05de |
| 3566500 | 7ffa | a5ea | d007 | 4000 | b807 | 2004 | da07 | 0000 | ba07 | 6004 | 8090 | 000d | 32bf | fff8 | 80a7 | 401b | 2300 | 05de | d004 | 6028 | 7ffa | a5e0 | d002 | 2004 |
| 3566560 | d004 | 6028 | 7ffa | a5dd | d002 | 200c | 7ffa | a5db | d004 | 6028 | 7ffa | a502 | 9010 | 2010 | 2100 | 05de | d024 | 2028 | 7fff | 917b | d006 | 2004 | 7ffa | a4fc |
| 3566640 | 9002 | 2001 | e404 | 2028 | b407 | bce0 | d024 | a004 | d004 | 2028 | b607 | bffc | d002 | 2004 | 7fff | b201 | d206 | 2004 | f806 | 200c | ba10 | 001a | ec07 | 0000 |
| 3566720 | 8090 | 0016 | 2280 | 0014 | c027 | 4000 | 80a7 | 401b | 3a80 | 0011 | c027 | 4000 | 7fff | 9166 | d007 | 0000 | 7ffa | a4e7 | 9002 | 2001 | d027 | 4000 | d007 | 4000 |
| 3567000 | 7fff | b1f0 | d207 | 0000 | b807 | 2004 | ec07 | 0000 | ba07 | 6004 | 8090 | 0016 | 32bf | fff2 | 80a7 | 401b | c027 | 4000 | ba27 | 401a | bb3f | 6002 | ba07 | 6001 |
| 3567060 | bb2f | 6002 | 7ffa | a4d6 | 9010 | 001d | 2100 | 05de | d404 | 2028 | d022 | a00c | d204 | 2028 | 9007 | bce0 | d202 | 600c | 4000 | 1ad9 | 9410 | 001d | fa04 | 2028 |
| 3567140 | 81c7 | e008 | 91e8 | 001d | 9de3 | bfa0 | 1100 | 05de | d002 | 2020 | fa06 | 4000 | 8090 | 0008 | 3280 | 0031 | f04e | 0000 | 1080 | 003a | ba10 | 2000 | d007 | 4000 |
| 3567220 | 1300 | 05dc | 7fff | fc51 | 9212 | 6195 | 8090 | 0008 | 3280 | 000d | d007 | 4000 | 7fff | ff8f | 9010 | 001d | 9210 | 0008 | 7fff | ff3d | 9010 | 001a | 8090 | 0008 |
| 3567300 | 2280 | 002b | ba10 | 2000 | d026 | 4000 | 1080 | 0028 | ba10 | 2001 | 9210 | 001a | 7fff | fc40 | 9002 | 2001 | 8090 | 0008 | 3280 | 0022 | ba10 | 2000 | 7fff | ff7e |
| 3567360 | 9010 | 001d | 9210 | 0008 | d007 | 4000 | 7fff | ff2b | 9002 | 2001 | 8090 | 0008 | 2280 | 0019 | ba10 | 2000 | d026 | 4000 | 1080 | 0016 | ba10 | 2001 | 9210 | 001a |
| 3567440 | 7fff | fc2e | 9002 | 2001 | 8090 | 0008 | 3280 | 0010 | ba10 | 2000 | c026 | 4000 | 1080 | 0003 | ba10 | 2001 | 80a6 | 202b | 02bf | ffd2 | 80a6 | 202d | 02bf | fff4 |
| 3567520 | d007 | 4000 | 7fff | fc21 | 9210 | 001a | 8090 | 0008 | 3280 | 0003 | ba10 | 2000 | ba10 | 2001 | 81c7 | e008 | 91e8 | 001d | 9de3 | bfa0 | 1100 | 05de | d002 | 2020 |
| 3567600 | fa06 | 4000 | 8090 | 0008 | 3280 | 002e | f04e | 0000 | 1080 | 0036 | ba10 | 2000 | d007 | 4000 | 1300 | 05dc | 7fff | fc0e | 9212 | 6197 | 8090 | 0008 | 1280 | 000d |
| 3567660 | 0100 | 0000 | 7fff | ff4c | 9010 | 001d | 9210 | 0008 | 4000 | 003e | 9010 | 001a | 8090 | 0008 | 2280 | 0027 | ba10 | 2000 | d026 | 4000 | 1080 | 0024 | ba10 | 2001 |
| 3567740 | 7fff | ff41 | 9010 | 001d | 9210 | 0008 | d007 | 4000 | 7fff | feee | 9002 | 2001 | 8090 | 0008 | 2280 | 001b | ba10 | 2000 | d202 | 2008 | 80a2 | 401a | 3280 | 0017 |
| 3570020 | ba10 | 2000 | d026 | 4000 | 1080 | 0014 | ba10 | 2001 | 4000 | 0014 | 9002 | 2001 | 80a6 | 8008 | 3280 | 000f | ba10 | 2000 | c026 | 4000 | 1080 | 000c | ba10 | 2001 |
| 3570100 | 80a6 | 202b | 02bf | ffd5 | 80a6 | 202d | 22bf | fff5 | d007 | 4000 | fa07 | 6008 | 80a7 | 401a | 3280 | 0003 | ba10 | 2000 | ba10 | 2001 | 81c7 | e008 | 91e8 | 001d |
| 3570160 | 9de3 | bfa0 | 1100 | 05de | fa02 | 2020 | 8090 | 001d | 3280 | 0004 | 9010 | 0018 | 1080 | 000a | ba10 | 2000 | 7fff | fec6 | 9207 | 6004 | 8090 | 0008 | 2280 | 0004 |
| 3570240 | 131f | ffff | 1080 | 0003 | fa02 | 2008 | ba02 | 63ff | 81c7 | e008 | 91e8 | 001d | 9de3 | bf80 | 1100 | 05de | fa02 | 2020 | 8090 | 001d | 3280 | 0004 | 1300 | 05dc |
| 3570320 | 1080 | 0036 | b210 | 2000 | b807 | bfec | 9010 | 001c | 9212 | 6199 | 7fff | 88a1 | 9410 | 0018 | 7fff | 90a5 | 9010 | 001c | 9610 | 0008 | d007 | 4000 | 1300 | 05dc |
| 3570400 | 9212 | 619c | 9410 | 001c | 9807 | bfe8 | 4000 | 174e | 9a07 | bfe4 | 8090 | 0008 | 2280 | 0004 | d207 | bfe4 | 1080 | 0022 | b210 | 2000 | 7fff | fdb3 | d007 | bfe8 |
| 3570460 | ba10 | 0008 | 7ffa | a4ed | d007 | bfe8 | 8090 | 001d | 3280 | 0004 | d406 | 6004 | 1080 | 0018 | b210 | 2000 | 8090 | 000a | 2280 | 000a | de06 | 600c | d606 | 6004 |
| 3570540 | d64a | c000 | 8090 | 000b | 2280 | 0005 | de06 | 600c | da06 | 6004 | da27 | 6004 | de06 | 600c | 8090 | 000f | 2280 | 000a | b210 | 001d | e006 | 600c | e004 | 0000 |
| 3570620 | 8090 | 0010 | 2280 | 0005 | b210 | 0014 | f206 | 600c | f227 | 600c | b210 | 001d | 81c7 | e008 | 91e8 | 0019 | 9de3 | bfa0 | 1100 | 05de | d002 | 2030 | 8090 | 0008 |
| 3570700 | 3280 | 0010 | 1700 | 05de | 9210 | 246c | 7ffa | a60b | 9010 | 2001 | ba10 | 0008 | 8090 | 001d | 3280 | 0004 | 1300 | 05dc | 1080 | 0008 | ba10 | 2000 | 9212 | 61b0 |
| 3570760 | d227 | 6468 | 1500 | 05de | fa22 | a030 | 1700 | 05de | fa02 | e030 | 81c7 | e008 | 91e8 | 001d | 9de3 | bb98 | 7fff | ffe8 | 0100 | 0000 | b810 | 0008 | 8090 | 001c |
| 3571040 | 2280 | 002f | ba10 | 2000 | 4000 | 0065 | 0100 | 0000 | d007 | 2024 | 8090 | 0008 | 2280 | 0029 | ba10 | 2000 | ba07 | bbff | d407 | 2024 | 9210 | 2400 | 4000 | 0dd7 |
| 3571120 | 9010 | 001d | 8090 | 0008 | 2280 | 001a | 1900 | 05dc | 7fff | 9048 | 9010 | 001d | 9210 | 0008 | 4000 | 03a0 | 9010 | 001d | 8090 | 0008 | 02bf | fff3 | d027 | bbf8 |
| 3571200 | 9410 | 0018 | 9010 | 001d | 4000 | 0188 | 9207 | bbf8 | 8090 | 0008 | 22bf | ffed | d407 | 2024 | 1700 | 05dc | d602 | e3e8 | 8090 | 000b | 1280 | 0004 | 0100 | 0000 |
| 3571260 | 4000 | 0067 | 0100 | 0000 | 1080 | 0009 | fa07 | bbf8 | d803 | 23e8 | 8090 | 000c | 3280 | 0005 | ba10 | 2000 | 4000 | 005f | 0100 | 0000 | ba10 | 2000 | 81c7 | e008 |
| 3571340 | 91e8 | 001d | 9de3 | bb98 | 7fff | ffb2 | 0100 | 0000 | b810 | 0008 | 8090 | 001c | 2280 | 002f | ba10 | 2000 | 4000 | 002f | 0100 | 0000 | d007 | 2024 | 8090 | 0008 |
| 3571420 | 2280 | 0029 | ba10 | 2000 | ba07 | bbff | d407 | 2024 | 9210 | 2400 | 4000 | 0da1 | 9010 | 001d | 8090 | 0008 | 2280 | 001a | 1900 | 05dc | 7fff | 9012 | 9010 | 001d |
| 3571500 | 9210 | 0008 | 4000 | 036a | 9010 | 0014 | 8090 | 0008 | 02bf | fff3 | d027 | bbf8 | 9410 | 0018 | 9010 | 001d | 4000 | 01bb | 9207 | bbf8 | 8090 | 0008 | 22bf | ffed |
| 3571560 | d407 | 2024 | 1700 | 05dc | d602 | e3e8 | 8090 | 000b | 1280 | 0004 | 0100 | 0000 | 4000 | 0031 | 0100 | 0000 | 1080 | 0009 | fa07 | bbf8 | d803 | 23e8 | 8090 | 000c |
| 3571640 | 3280 | 0005 | ba10 | 2000 | 4000 | 0029 | 0100 | 0000 | ba10 | 2000 | 81c7 | e008 | 91e8 | 001d | 9de3 | bfa0 | 7fff | ff7c | 0100 | 0000 | ba10 | 0008 | 8090 | 001d |
| 3571720 | 0280 | 001d | 0100 | 0000 | d007 | 6464 | 8090 | 0008 | 3280 | 0006 | d207 | 6024 | 9210 | 2000 | 4000 | 133f | 9007 | 6464 | d207 | 6024 | 8090 | 0009 | 1280 | 0008 |
| 3572000 | 0100 | 0000 | d007 | 6468 | 1300 | 05dc | 4000 | 0ea7 | 9212 | 61bc | 1080 | 0004 | d027 | 6024 | 4000 | 0e39 | d007 | 6024 | d407 | 6028 | 8090 | 000a | 0280 | 0004 |
| 3572060 | 0100 | 0000 | 7ffa | a42d | d007 | 6028 | 4000 | 03af | c027 | 6028 | 81c7 | e008 | 81e8 | 0000 | 9de3 | bfa0 | 7fff | ff58 | 0100 | 0000 | ba10 | 0008 | 8090 | 001d |
| 3572140 | 0280 | 0013 | 0100 | 0000 | d007 | 6024 | 8090 | 0008 | 2280 | 0006 | d207 | 6028 | 7fff | 8e3c | d007 | 6024 | c027 | 6024 | d207 | 6028 | 8090 | 0009 | 0280 | 0004 |
| 3572220 | 0100 | 0000 | 7ffa | a415 | d007 | 6028 | 4000 | 0397 | c027 | 6028 | 4000 | 099b | 0100 | 0000 | 81c7 | e008 | 81e8 | 0000 | 9de3 | bfc0 | 7fff | ff3e | 0100 | 0000 |

```
3572300  ba10 0008 8090 001d 3280 0004 f027 6468 1080 0003 ba10 2000 ba10 2001 81c7 e008 91e8 001d d44a 0000 8090 000a 2280 0010
3572360  da4a 0000 d24a 0000 80a2 603a 2280 000c da4a 0000 d64a 0000 80a2 e00a 2280 0008 da4a 0000 9002 2001 d44a 0000 8090 000a
3572440  32bf fff6 d24a 0000 da4a 0000 80a3 600a 3280 0004 d84a 0000 1080 0007 c02a 0000 8090 000c 0280 0004 0100 0000 c02a 0000
3572520  9002 2001 81c3 e008 0100 0000 9de3 bb90 7fff ff14 0100 0000 b810 0008 8090 001c 3280 0004 d007 2464 1080 00ca ba10 2000
3572600  8090 0008 3280 0006 d207 2024 9210 2000 4000 12d6 9007 2464 d207 2024 8090 0009 3280 000c d607 2028 d007 2468 1300 05dc
3572660  4000 0e3e 9212 61be 8090 0008 1280 0004 d027 2024 1080 00b7 ba10 2000 d607 2028 b607 bbf3 8090 000b 2280 0034 9407 bff4
3572740  d007 2028 d207 202c 1500 05de 4000 0288 d402 a034 ba10 0008 7ffa a3bc d007 2028 8090 001d 2280 00a7 ba10 2000 4000 0199
3573020  0100 0000 4000 03ac 9010 001d 8090 0008 0280 00a0 0100 0000 d607 2028 8090 000b 32bf ffed d007 2028 9407 bff4 9207 bff8
3573100  4000 0960 9007 bffc 8090 0008 0280 001d 0100 0000 d007 bff8 8090 0008 2280 000f d607 2028 1300 05de 4000 01c6 d202 6034
3573160  ba10 0008 8090 001d 2280 0008 d607 2028 4000 0391 9010 001d 8090 0008 0280 0085 c100 0000 d607 2028 8090 000b 32bf ffd2
3573240  d007 2028 9407 bff4 9207 bff8 4000 0945 9007 bffc 8090 0008 32bf ffe8 d007 bff8 4000 0914 0100 0000 d407 2024 9010 001b
3573320  4000 0cb6 9210 2400 8090 0008 2280 0071 ba10 2000 7fff 8f27 9010 001b 9210 0008 4000 027f 9010 001b ba10 0008 8090 001d
3573400  3280 005e d04f bbf3 1080 0066 ba10 2000 d007 4000 1300 05dc 7fff fa30 9212 61c0 8090 0008 3280 0009 de4f bbf4 4000 0175
3573460  0100 0000 4000 0321 9010 001d 1b00 05de 10bf ffd5 d023 6034 80a3 e040 1280 0018 0100 0000 4000 0319 9010 001d 2300 05de
3573540  d024 6034 d007 4000 d607 2464 1500 05dc 9412 a1c2 9002 2002 4000 0a18 9210 2000 8090 0008 2280 0006 d007 4000 4000 015d
3573620  0100 0000 10bf ffc1 d607 2028 4000 08b3 9002 2002 10bf ffbd d607 2028 4000 0303 9010 001d 2500 05de d024 a034 d007 4000
3573700  10bf ffa9 9002 2001 80a4 e040 1280 0027 d007 4000 d607 2464 1500 05dc 9412 a1c4 9002 2002 4000 09fd 9210 2000 8090 0008
3573760  2280 0004 d007 4000 1080 002a ba10 2000 4000 089a 9002 2002 9007 bffc 9207 bff8 4000 08ec 9407 bff4 8090 0008 0280 000f
3574040  0100 0000 d007 bff8 8090 0008 2280 0005 9407 bff4 4000 02c8 0100 0000 9407 bff4 9207 bff8 4000 08df 9007 bffc 8090 0008
3574120  32bf fff6 d007 bff8 4000 08ae 0100 0000 10bf ff8e d607 2028 4000 02bb 9002 2001 10bf ff8a d607 2028 80a2 202b 02bf ffa5
3574200  80a2 202d 22bf ffd1 e64f bbf4 4000 030e 9010 001d 8090 0008 32bf ff80 d607 2028 81c7 e008 91e8 001d 9de3 bfa0 7fff fe41
3574260  0100 0000 fa06 4000 b810 0008 8090 001c 3280 0055 d04e 0000 1080 005f ba10 2000 d007 4000 1300 05dc 7fff f9c0 9212 61c6
3574340  8090 0008 3280 000d f04e 2001 4000 02b3 9010 001d 9210 0008 4000 0122 9010 001a 8090 0008 2280 0050 ba10 2000 d026 4000
3574420  1080 004d ba10 2001 80a6 2040 1280 0015 d007 4000 d607 2464 9002 2002 9410 001a 4000 09aa 9210 2000 8090 0008 2280 0042
3574500  ba10 2000 4000 029d 9010 001d 9210 0008 4000 010c 9010 001a 8090 0008 2280 003a ba10 2000 d026 4000 1080 0037 ba10 2001
3574560  9210 001a 7fff f999 9002 2001 8090 0008 3280 0031 ba10 2000 4000 028c 9010 001d 9210 0008 d007 4000 4000 00fa 9002 2001
3574640  8090 0008 2280 0028 ba10 2000 d026 4000 1080 0025 ba10 2001 80a6 2040 1280 000d d007 4000 d607 2464 9002 2002 9410 001a
3574720  4000 0982 9210 2000 8090 0008 2280 001a ba10 2000 c026 4000 1080 0017 ba10 2001 9210 001a 7fff f979 9002 2001 8090 0008
3575000  3280 0011 ba10 2000 c026 4000 1080 000e ba10 2001 80a2 202b 02bf ffae 80a2 202d 22bf ffe6 f04e 2001 d007 4000 7fff f96b
3575060  9210 001a 8090 0008 3280 0003 ba10 2000 ba10 2001 81c7 e008 91e8 001d 9de3 bea0 7fff fdd8 0100 0000 fa06 4000 b810 0008
3575140  8090 001c 3280 0064 d04e 0000 1080 006c ba10 2000 d007 4000 1300 05dc 7fff f957 9212 61c8 8090 0008 3280 000d f04e 2001
3575220  4000 024a 9010 001d 9210 0008 4000 0107 9010 001a 8090 0008 2280 005d ba10 2000 d026 4000 1080 005a ba10 2001 80a6 2040
3575300  1280 001b 0100 0000 d207 4000 b007 bf00 9010 0018 7fff aebb 9202 6002 4000 0237 9010 001d 9210 0008 4000 00f4 9010 001a
3575360  ba10 0008 8090 001d 2280 0049 ba10 2000 d407 4000 d607 2464 9210 2000 4000 0933 9010 0018 8090 0008 2280 0041 ba10 2000
3575440  fa26 4000 1080 003e ba10 2001 4000 0223 9010 001d 9210 0008 d007 4000 4000 0091 9002 2001 8090 0008 2280 0035 ba10 2000
3575520  d602 2008 80a2 c01a 3280 0031 ba10 2000 d026 4000 1080 002e ba10 2001 80a6 2040 3280 0019 d007 4000 d207 4000 b007 bf00
3575600  9010 0018 7fff ae8f 9202 6002 9010 001a 4000 00ca 9210 001c 9410 0008 8090 000a 2280 001f ba10 2000 d402 8000 d607 2464
3575660  9210 2000 4000 0909 9010 0018 8090 0008 2280 0017 ba10 2000 c026 4000 1080 0014 ba10 2001 4000 0014 9002 2001 80a6 8008
3575740  3280 000f ba10 2000 c026 4000 1080 000c ba10 2001 80a2 202b 02bf ff9f 80a2 202d 22bf ffdb f04e 2001 fa07 6008 80a7 401a
3576020  3280 0003 ba10 2000 ba10 2001 81c7 e008 91e8 001d 9de3 bfa0 7fff fd62 0100 0000 ba10 0008 8090 001d 3280 0004 9210 001d
3576100  1080 000a ba10 2000 4000 004e 9010 0018 9090 0008 2280 0004 111f ffff 1080 0003 fa02 2008 ba02 23ff 81c7 e008 91e8 001d
3576160  9de3 bf90 7fff fd4f 0100 0000 ba10 0008 9090 001d 0280 001d c027 bffc 9207 602c d223 a060 9007 6028 d023 a05c d607 6034
3576240  d407 6030 d007 6464 1300 05dc 9212 61ca 9a07 bff8 4000 1291 9807 bffc 8090 0008 2280 0004 d407 6030 c027 6028 d407 6030
3576320  8090 000a 2280 0005 d607 bffc 7ffa a203 d007 6030 d607 bffc d627 6030 d807 bff8 d827 6034 ba10 2000 81c7 e008 91e8 001d
3576400  9de3 bf98 7fff fd2b 0100 0000 ba10 0008 8090 001d 0280 0019 c027 bffc d007 6464 1300 05dc 9212 61d8 9807 6028 9407 bffc
3576460  9a07 602c 4000 113d 9607 bff8 8090 0008 2280 0004 d007 6030 c027 6028 d007 6030 8090 0008 2280 0005 d207 bffc 7ffa a1e3
3576540  d007 6030 d207 bffc d227 6030 d407 bff8 d427 6034 ba10 2000 81c7 e008 91e8 001d 9de3 bf98 7fff fd0b 0100 0000 ba10 0008
3576620  8090 001d 2280 0047 b210 2000 7fff 8d79 9010 0018 9610 0008 d007 6464 1300 05dc 9212 61e6 9410 0018 9807 bffc 4000 1422
3576700  9a07 bff8 8090 0008 2280 0004 d207 bff8 1080 0038 b210 2000 4000 00c5 d007 bffc ba10 0008 7ffa a1c1 d007 bffc 8090 001d
3576760  3280 0004 d006 6004 1080 002e b210 2000 8090 0008 2280 000a d806 6018 d206 6004 d24a 4000 8090 0009 2280 0005 d806 6018
3577040  d606 6004 d627 6004 d806 6018 8090 000c 2280 000a e206 601c da06 6018 da4b 4000 8090 000d 2280 0005 e206 601c e006 6018
3577120  e027 6018 e206 601c 8090 0011 2280 000a ea06 6020 e406 601c e44c 8000 8090 0012 2280 0005 ea06 6020 e806 601c e827 601c
3577200  ea06 6020 8090 0015 2280 000a b210 001d ec06 6020 ec4d 8000 8090 0016 2280 0005 b210 001d f206 6020 f227 6020 b210 001d
3577260  81c7 e008 91e8 0019 9de3 bf80 7fff fcbd 0100 0000 ba10 0008 8090 001d 3280 0004 1300 05dc 1080 004c b210 2000 b807 bfec
3577340  9010 001c 9212 61f4 7fff 8520 9410 0018 7fff 8d24 9010 001c 9610 0008 d007 6464 1300 05dc 9212 61f7 9410 001c 9807 bfe8
```

```
3577420  4000 13cd 9a07 bfe4 8090 0008 2280 0004 d207 bfe4 1080 0038 b210 2000 4000 0070 d007 bfe8 ba10 0008 7ffa a16c d007 bfe8
3577500  8090 001d 3280 0004 d206 6004 1080 002e b210 2000 8090 0009 2280 000a da06 6018 d406 6004 d44a 8000 8090 000a 2280 0005
3577560  da06 6018 d806 6004 d827 6004 da06 6018 8090 000d 2280 000a e406 601c de06 6018 de4b c000 8090 000f 2280 0005 e406 601c
3577640  e206 6018 e227 6018 e406 601c 8090 0012 2280 000a ec06 6020 e606 601c e64c c000 8090 0013 2280 0005 ec06 6020 ea06 601c
3577720  ea27 601c ec06 6020 8090 0016 2280 000a b210 001d ee06 6020 ee4d c000 8090 0017 2280 0005 b210 001d f206 6020 f227 6020
3600000  b210 001d 81c7 e008 91e8 0019 9de3 bfa0 9010 0018 4000 0036 9210 0019 b010 0008 8090 0018 3280 0004 d006 a004 1080 002e
3600060  b410 2000 8090 0008 2280 000a d806 a018 d206 a004 d24a 4000 8090 0009 2280 0005 d806 a018 d606 a004 d626 2004 d806 a018
3600140  8090 000c 2280 000a e206 a01c da06 a018 da4b 4000 8090 000d 2280 0005 e206 a01c e006 a018 e026 2018 e206 a01c 8090 0011
3600220  2280 000a ea06 a020 e406 a01c e44c 8000 8090 0012 2280 0005 ea06 a020 e806 a01c e826 201c ea06 a020 8090 0015 2280 000a
3600300  b410 0018 ec06 a020 ec4d 8000 8090 0016 2280 0005 b410 0018 f406 a020 f426 2020 b410 0018 81c7 e008 91e8 001a 9de3 bf98
3600360  7fff fc30 0100 0000 ba10 0008 8090 001d 3280 0004 b807 6060 1080 007a b210 2000 9410 0019 9010 001c 4000 05ae 9210 0018
3600440  9410 200a b207 0019 d42e 4000 c02e 6001 d64f 0000 80a2 e02b 3280 0003 9a10 2000 9a10 2001 b210 001c e04e 4000 1f00 0292
3600520  8090 0010 b610 000d b410 2000 0280 0011 b003 e131 e24e 4000 80a4 603a 2280 000e 8090 001a e84e 4000 e84d 0018 808d 2008
3600600  3280 0004 b206 6001 1080 0006 b410 2001 e04e 4000 8090 0010 32bf fff4 e24e 4000 8090 001a 3280 0004 9010 001c 1080 0051
3600660  b210 2000 7fff fccc f827 603c 7fff fcca d027 6040 b210 0008 ee4e 4000 80a5 e03a 3280 0007 9410 200a 8090 001b 3280 0004
3600740  9410 200a 1080 0043 b210 2000 9010 0019 4000 058a 9207 bffc f207 bffc b010 0008 d24e 4000 b206 6001 80a2 603a 2280 0007
3601020  f027 6044 8090 001b 3280 0004 f027 6044 1080 0034 b210 2000 d84e 4000 80a3 203a 3280 0007 9410 200a 8090 001b 3280 0004
3601100  9410 200a 1080 002b b210 2000 9010 0019 4000 0572 9207 bffc f207 bffc b010 0008 de4e 4000 b206 6001 80a3 e03a 2280 0007
3601160  2500 05dc 8090 001b 3280 0004 2500 05dc 1080 001c b210 2000 f027 6048 c027 604c a414 a1a8 e427 6050 f227 6054 7fff fc92
3601240  9010 0019 7fff fc90 d027 6058 b210 0008 f227 605c e64e 4000 8090 0013 2280 000c c02e 4000 e84e 4000 80a5 200a 2280 0008
3601320  c02e 4000 b206 6001 e64e 4000 8090 0013 32bf fffa e84e 4000 c02e 4000 b207 603c 81c7 e008 91e8 0019 9de3 bfa0 7fff fbad
3601400  0100 0000 b810 0008 8090 001c 0280 0010 0100 0000 fa07 2038 8090 001d 2280 000b ba10 2000 7ffa a071 d007 4000 7ffa a06f
3601460  9010 001d fa07 6004 8090 001d 12bf fffa 0100 0000 ba10 2000 c027 2038 81c7 e008 91e8 001d 9de3 bfa0 7fff fb96 0100 0000
3601540  ba10 0008 8090 001d 0280 0012 0100 0000 7ffa 9f87 9010 2008 b810 0008 7fff 8c01 9010 0018 7ffa 9f82 9002 2001 b610 0008
3601620  9010 001b 7fff ac8b 9210 0018 f627 0000 d007 6038 d027 2004 f827 6038 ba10 2000 81c7 e008 91e8 001d 9de3 bfa0 1100 05de
3601700  d002 2038 8090 0008 0280 0010 2100 05de d004 2038 7ffa a045 d002 2004 d004 2038 7ffa a042 d002 2018 d004 2038 7ffa a03f
3601760  d002 201c d004 2038 7ffa a03c d002 2020 7ffa a03a d004 2038 7ffa 9f61 9010 2024 2f00 05de d025 e038 7fff 8bda d006 2004
3602040  7ffa 9f5b 9002 2001 de05 e038 d023 e004 d005 e038 d002 2004 7fff ac62 d206 2004 7fff 8bd0 d006 2018 7ffa 9f51 9002 2001
3602120  e205 e038 d024 6018 d005 e038 d002 2018 7fff ac58 d206 2018 7fff 8bc6 d006 201c 7ffa 9f47 9002 2001 e605 e038 d024 e01c
3602200  d005 e038 d002 201c 7fff ac4e d206 201c 7fff 8bbc d006 2020 7ffa 9f3d 9002 2001 ea05 e038 d025 6020 d005 e038 d002 2020
3602260  7fff ac44 d206 2020 f005 e038 81c7 e008 81e8 0000 9de3 bfa0 7fff fb3a 0100 0000 8090 0008 2280 0013 ba10 2000 f006 0000
3602340  fa02 2038 8090 001d 2280 000e ba10 2000 d007 4000 7fff f6b9 9210 0018 8090 0008 3280 0004 fa07 6004 1080 0006 ba10 2001
3602420  8090 001d 32bf fff8 d007 4000 ba10 2000 81c7 e008 91e8 001d 9de3 b320 ae07 b800 1500 05de c022 a040 ac07 bfff 1300 05dc
3602500  9212 6210 c02d 8000 7fff ac1e 9010 0017 9207 b7c0 7ffd 89ed 9010 0017 8090 0008 1680 0008 b405 e002 1300 05dc 9212 6213
3602560  7fff ac14 9010 0018 1080 00d2 ba10 2000 1900 05dc d803 2208 8090 000c 3280 0016 d057 b7c0 9210 2408 7ffa a118 9010 2001
3602640  1b00 05dc d023 6208 e207 b7c4 e457 b7c0 1100 05dc 9012 2227 7ffd 89d4 9207 b780 8090 0008 3680 002c d207 b7c4 1300 05dc
3602720  9212 6229 7fff abfb 9010 0018 1080 00b9 ba10 2000 1f00 05dc de03 e208 de53 c000 80a2 000f 32bf ffee e207 b7c4 d607 b7c4
3603000  1300 05dc d202 6208 d202 6004 80a2 c009 32bf ffe7 e207 b7c4 1100 05dc d002 2208 9207 b780 7ffd 89b9 9002 2008 8090 0008
3603060  32bf ffdf e207 b7c4 da57 b780 d857 b7c0 80a3 000d 32bf ffda e207 b7c4 e007 b784 de07 b7c4 80a3 c010 32bf ffd5 e207 b7c4
3603140  1300 05dc d202 6208 9010 0018 1080 0093 9202 6008 e607 b784 e857 b780 80a2 4013 1280 0006 aa07 b380 d457 b7c0 80a2 8014
3603220  2280 0078 d04d 8000 f257 b7c0 f607 b7c4 9010 001a 1300 05dc 7fff abc6 9212 623d 4000 03bc 9010 0017 b810 0008 8090 001c
3603300  1280 0008 b406 a003 1300 05dc 9212 6241 7fff abbc 9010 0018 1080 007a ba10 2000 d007 0000 7fff 8b1d 9207 b7c0 80a2 3fff
3603360  3280 0008 d657 b7c0 1300 05dc 9212 6256 7fff abb0 9010 0018 1080 006e ba10 2000 80a6 400b 3280 001d 9210 0015 d897 b7c4
3603440  80a6 c00c 1280 0006 0100 0000 7fff f6db 9010 001c 1080 004f d04d 8000 4000 03d5 9010 001c ba10 0008 8090 001d 3280 000a
3603520  da07 6004 7fff f6d1 9010 001c 1300 05dc 9212 626b 7fff ab97 9010 0018 1080 0055 ba10 2000 80a3 401b 2280 002c 9210 0016
3603600  10bf ffef 0100 0000 4000 006d 9010 0019 8090 0008 0290 0009 0100 0000 7fff f6bf 9010 001c 9010 0015 4000 0048 9210 0016
3603660  1080 002f ac10 0008 4000 03b6 9010 001c ba10 0008 8090 001d 3280 000a 9010 001a 7fff f6b2 9010 001c 1300 05dc 9212 6283
3603740  7fff ab78 9010 0018 1080 0036 ba10 2000 7fff ab74 9207 600c 9207 b780 4000 0a77 9010 0017 de07 b784 80a3 c01b 12bf ffeb
3604020  0100 0000 e057 b780 80a4 0019 12bf ffe7 0100 0000 9210 0016 4000 0028 9007 600c 9210 0008 1100 05dc 4000 0024 9012 229b
3604100  ac10 0008 7fff f695 9010 001c d207 b7c4 80a2 4013 32bf ff92 f257 b7c0 d457 b7c0 80a2 8014 32bf ff8e f257 b7c0 d04d 8000
3604160  8090 0008 3280 0006 9210 0016 1300 05dc 9010 0018 1080 0003 9212 629d 9010 0018 7fff ab4c 0100 0000 1100 05dc d402 2208
3604240  9210 0018 e432 8000 d602 2208 e222 e004 1002 2208 9002 2008 7fff ab42 ba10 0018 81c7 e008 91e8 001d d64a c000 8090 000b
3604320  0280 0007 9a10 2000 9002 2001 d64a 0000 8090 000b 12bf fffd 9a03 6001 1700 05de d402 e040 9402 800d 80a2 a400 1680 000e
3604400  d422 e040 9810 000d 8090 000c 0480 000a 9a23 6001 9810 000d 9022 2001 c24a 0000 8090 000c 9222 6001 9a23 6001 14bf fffa
3604460  c22a 4000 81c3 e008 9000 0009 9de3 bf60 b12e 2010 b13e 2010 b410 2000 4000 0062 0100 0000 ae10 0008 8090 0017 2680 005c
```

```
3604540  b810 2000 9010 0017 7fff 8a7c 9207 bfc0 9090 0008 2680 0056 b810 2000 4000 0a03 0100 0000 b810 0008 d007 bfd4 7fff 6cad
3604620  9210 001c d207 bfd4 9410 2001 9207 0009 9222 4908 9010 2000 9610 2001 9810 0017 4000 0a1e 9a10 2000 b810 0008 80a7 3fff
3604700  3280 0006 d207 bfd4 7ffd 8acc 9010 0017 1080 003f b810 2000 4000 0101 9010 001c 8090 0008 2280 0009 b807 2002 7ffd 8ac3
3604760  9010 0017 1100 05dc 7ffd 8ae8 9012 229f 1080 002f b406 a001 f657 0000 b807 2002 9e10 001b b626 e001 b72e e010 8090 000f
3605040  0460 0024 b73e e010 ba10 001c e057 6002 80a6 0010 3280 0018 fa57 4000 9010 0019 7fff aae0 9207 6004 7ffd 8aac 9010 0017
3605120  9010 0019 4000 09e1 9207 bfc0 8090 0008 2680 0007 1100 05dc e257 bfc0 80a4 4018 0280 0007 0100 0000 1100 05dc 7ffd 8ac7
3605200  9012 22ab 1080 000e b406 a001 1080 0010 b810 2001 9e10 001b b626 e001 b72e e010 8090 000f b807 001d 14bf ffe0 b73e e010
3605260  7ffd 0a92 9010 0017 b406 a001 80a6 a001 04bf ffa3 0100 0000 b810 2000 81c7 e008 91e8 001c 9de3 bee0 1100 05dc 9012 22b7
3605340  7ffd 888a 9207 bfc0 8090 0008 2680 00ba ba10 3fff 1100 05dc 9012 22c1 9410 21a4 7ffd 8a92 9210 2202 aa10 0008 8090 0015
3605420  2680 00b1 ba10 3fff 9010 0015 7fff 8a0f 9207 bf80 8090 0008 3680 0006 d207 bfa0 7ffd 8a72 9010 0015 1080 00a7 ba10 3fff
3605500  d007 bfe0 80a2 0009 3680 0008 1700 05dc 1407 bf94 8090 000a 2280 0004 1700 05dc 1080 009d ba10 0015 a602 e2cd 4000 00c9
3605560  9010 0013 4000 09a3 9010 2000 ba10 0008 9010 0013 9210 2202 7ffd 8a70 9410 21b6 a810 0008 8090 0014 1680 0006 0100 0000
3605640  4000 0998 9010 001d 1080 0084 0100 0000 4000 0994 9010 001d 4000 0974 0100 0000 b210 0008 9010 0014 4000 009a 9210 0019
3605720  8090 0008 0680 0079 9a10 2000 9810 0014 9610 2001 9410 2003 9210 0019 4000 098f 9010 2000 80a2 3fff 0280 0070 b602 2002
3606000  b010 001b a410 0008 ac10 0008 1100 05dc 1300 05dc 9212 62e9 9012 22df 4000 0193 c036 0000 ae10 0008 8090 0017 0280 0063
3606060  b606 e002 4000 01bf 9010 0017 b810 0008 8090 001c 0280 003b b426 c016 a006 a004 a004 2004 80a4 0019 0480 0006 ba10 001b
3606140  4000 01ac 9010 0017 1080 0054 0100 0000 4007 2004 4000 0959 9207 bf40 8090 0008 0680 0026 0100 0000 d057 bf40 d037 6002
3606220  7fff 89bc d007 2004 9210 2004 9202 4008 9202 6001 d237 4000 da57 4000 9e10 2003 8090 000d 3680 0005 9a0b 400f 9a20 000d
3606300  9a0b c00d 9a20 000d e257 4000 a204 6004 a224 400d e237 4000 d457 4000 b406 800a 80a6 8019 2480 0006 d207 2004 4000 0189
3606360  9010 0017 1080 0031 0100 0000 7fff aa31 9007 6004 da56 0000 9a03 6001 da36 0000 fa57 4000 b606 c01d 4000 0186 9010 0017
3606440  b810 0008 8090 001c 32bf ffc9 b426 c016 4000 0178 9010 0017 ba26 c016 9227 6002 4000 0027 9005 a002 d034 8000 9010 0014
3606520  4000 08fa 9210 001d 8090 0008 0680 0017 0100 0000 7ffd 89e5 9010 0014 7ffd 89e3 9010 0015 1300 05dc 9212 62eb 7ffd 89fd
3606600  9010 0013 8090 0008 2680 0013 ba10 3fff 1100 05dc 9012 22f7 7ffd 89ec 9210 2000 ba10 0008 8090 001d 1680 000b 0100 0000
3606660  1080 0009 ba10 3fff 7ffd 89d0 9010 0015 7ffd 89ce 9010 0014 7ffd 89f4 9010 0013 ba10 3fff 81c7 e008 91e8 001d 9610 0009
3606740  8090 000b 1690 0003 9a10 2000 9602 e001 973a e001 8090 000b 0280 000b 9222 e001 d452 0000 9810 0009 9a1b 400a 9b2b 6010
3607020  8090 000c 9002 2002 9222 6001 12bf fff9 9b3b 6010 912b 6010 81c3 e008 913a 2010 9de3 bfa0 80a6 6001 3680 0004 9410 2000
3607100  1080 0012 b010 3fff 9010 0018 4000 0903 9226 6001 80a2 3fff 3280 0004 1300 05dc 1080 000a b010 3fff 9212 6303 9410 2001
3607160  7ffe 0b7e 9010 0018 80a2 2001 2280 0003 b010 2000 b010 3fff 81c7 e008 81e8 0000 9de3 bfa0 4000 08c7 b810 2000 b610 0008
3607240  7fff 8938 9010 0018 ba06 0008 ba27 6001 144f 4000 80a2 a058 3280 0015 ba07 6001 b807 2001 80a7 2006 3880 0011 ba07 6001
3607320  9210 200a 7fff 6b59 9010 001b 9002 2030 102f 4000 9010 001b 7ffe 0a26 9210 200a ba27 6001 d44f 4000 b610 0008 80a2 a058
3607400  22bf fff1 b807 2001 ba07 6001 de4f 4000 8090 000f 2280 0013 9210 2000 a010 2061 e02f 4000 9210 2000 7fff a988 9010 0018
3607460  8090 0008 1280 0011 0100 0000 e24f 4000 a204 6001 a32ç 6018 a33c 6018 80a4 607a 04bf fff5 e22f 4000 1080 0008 c02e 0000
3607540  7fff a97a 9010 0018 8090 0008 1280 0003 0100 0000 c02e 0000 81c7 e008 81e8 0000 9de3 bfa0 1100 05de d002 2048 8090 0008
3607620  3280 0008 1500 05de 9210 2018 7ffa 9e97 9010 2001 1300 05de d022 6048 1500 05de f002 a048 81c7 e008 81e8 0000 da02 0000
3607700  d24b 4000 1500 0292 8090 0009 0280 000c 9802 a131 c24b 4000 c248 400c 8088 6008 2280 0008 c44b 4000 9a03 6001 d24b 4000
3607760  8090 0009 32bf fff9 c24b 4000 c44b 4000 8090 0002 0280 000c 9610 000d c64b 4000 c648 c00c 8088 e008 3280 0008 c84b 4000
3610040  9a03 6001 c44b 4000 8090 0002 32bf fff9 c64b 4000 c84b 4000 8090 0004 2280 0005 da22 0000 c02b 4000 9a03 6001 da22 0000
3610120  81c3 e008 9000 000b 9de3 bfc0 fa06 0000 1100 0292 d24f 4000 b810 2000 8090 0009 0280 000c b602 2131 d64f 4000 d64a c01b
3610200  808a e008 2280 0008 de4f 4000 ba07 6001 124f 4000 8090 0009 32bf fff9 d64f 4000 de4f 4000 8090 000f 2280 0012 d04f 4000
3610260  e24f 4000 e24c 401b 808c 6004 2280 000d d04f 4000 a92f 2001 f84f 4000 ba07 6001 de4f 4000 ab2d 2002 a805 0015 8090 000f
3610340  b827 2030 12bf fff3 b805 001c d04f 4000 8090 0008 2280 000d da4f 4000 d44f 4000 d44a 801b 808a a008 3280 0008 da4f 4000
3610420  ba07 6001 d04f 4000 9090 0008 32bf fff9 d44f 4000 da4f 4000 8090 000d 2280 0005 fa26 0000 c02f 4000 ba07 6001 fa26 0000
3610500  81c7 e008 91e8 001c 9de3 bf98 1100 05dc d002 2308 8090 0008 3280 0007 1100 05dc 7ffa 9c0b 9010 2401 1300 05dc d022 6308
3610560  1100 05dc d002 2308 9410 0018 4000 060b 9210 2100 d027 bffc d407 bffc 8090 000a 3280 0004 d607 bffc 1080 0032 b010 3fff
3610640  d64a c000 80a2 e023 22bf fff3 1100 05dc 7fff ff83 9007 bffc d026 4000 de07 bffc de4b c000 8090 000f 2280 0026 b010 2001
3610720  7fff ff7b 9007 bffc d026 6004 e407 bffc e44c 8000 8090 0012 2280 001e b010 2002 7fff ff73 9007 bffc d026 6008 ea07 bffc
3611000  ea4d 4000 8090 0015 2280 0016 b010 2003 7fff ff6b 9007 bffc d026 600c f407 bffc f44e 8000 8090 001a 2280 000e b010 2004
3611060  7fff ff8a 9007 bffc d026 6010 fa07 bffc fa4f 4000 8090 001d 2280 0006 b010 2005 7fff ff82 9007 bffc d026 6014 b010 2006
3611140  81c7 e008 81e8 0000 9de3 bfa0 9010 0018 4000 070e 9210 0019 b010 0008 8090 0018 3280 0004 d04e 4000 1080 0020 b210 2000
3611220  8090 0008 2280 001d b210 0018 d24e 4000 80a2 6077 2280 000b d04e 2012 d64e 4000 80a2 e061 2280 0007 d04e 2012 da4e 4000
3611300  80a3 602b 3280 000c b206 6001 d04e 2012 4000 0790 9210 2002 8090 0008 3680 000b b210 0018 7fff 86a1 9010 0018 1080 0007
3611360  b210 2000 d04e 4000 8090 0008 32bf ffe9 124e 4000 b210 0018 81c7 e008 91e8 0019 9de3 bfa0 8090 0018 0280 0004 0100 0000
3611440  7fff 8692 9010 0018 81c7 e008 91e8 2001 9de3 bfa0 8090 0018 2280 0014 b010 2000 7fff ff10 0100 0000 8090 0008 3280 0004
3611520  1300 05de 1080 000d b010 2000 d202 6048 7fff ff7a 9010 0018 80a2 3fff 0280 0004 80a2 2006 2280 0004 1100 05de 1080 0003
3611600  b010 2000 f002 2048 81c7 e008 81e8 0000 9de3 bfa0 9010 0018 9210 2000 4000 05d3 9410 2002 8090 0008 3680 0004 8090 0019
```

```
3611660  1080 001a b210 2001 3280 0004 4006 4000 1080 0016 b210 2001 8090 0008 0280 000e 0100 0000 d206 6004 8090 0009 0280 000a
3611740  0100 0000 d406 6008 8090 000a 0280 0006 0100 0000 d606 600c 8090 000b 3280 0004 9210 0019 1080 0005 b210 2001 4000 0056
3612020  9010 0018 b210 2000 81c7 e008 91e8 0019 da02 0000 d24b 4000 1500 0292 8090 0009 0280 000c 9802 a131 d64b 4000 d64a c00c
3612100  808a e008 2280 0008 c24b 4000 9a03 6001 d24b 4000 8090 0009 32bf fff9 d64b 4000 c24b 4000 8090 0001 0280 000b 9810 000d
3612160  c44b 4000 80a0 a02c 2280 0008 c64b 4000 9a03 6001 c24b 4000 8090 0001 32bf fffa c44b 4000 c64b 4000 8090 0003 2280 0005
3612240  da22 0000 c02b 4000 9a03 6001 da22 0000 81c3 e008 9000 000c 9de3 bf98 1100 05de d002 204c 8090 0008 3280 000c 2100 05de
3612320  9210 2001 7ffa 9449 9010 2100 1500 05de d022 a04c d402 a04c 8090 000a 2280 001c ba10 2000 2100 05de d004 204c 7fff a831
3612400  d206 200c e004 204c e027 bffc 7fff ffc5 9007 bffc ba10 0008 d84f 4000 8090 000c 2280 000f ba10 2000 7fff 8796 9010 0019
3612460  9410 0008 9010 0019 4000 008e 9210 001d 9090 0008 12bf fff2 1b00 05de da03 604c 9a27 400d fa06 200c ba03 401d 81c7 e008
3612540  91e8 001d 9de3 bf98 d006 6010 d023 a05c d206 6014 9010 0018 d223 a060 d406 4000 d606 6004 d806 6008 da06 600c 1300 05dc
3612620  4000 06ac 9212 6310 81c7 e008 91e8 2000 9de3 bf60 9010 0018 7ffd 87e8 9210 2000 ba10 0008 80a7 7fff 3280 0004 9010 001d
3612700  1000 0032 b010 2000 7fff 8764 9207 bfc0 80a2 3fff 3280 0006 d217 bfc8 7ffd 87c7 9010 001d 1080 0029 b010 2000 1500 003c
3612760  920a 400a 1900 0010 80a2 400c 0280 0009 1f00 0295 9a10 2014 9010 001d da23 e1c8 7ffd 87ba b010 2000 1080 001c 0100 0000
3613040  7ffa 9adb 9010 2018 b010 0008 8090 0018 2280 0008 8090 0019 7ffa 9ad5 d007 bff0 8090 0008 1280 000b d026 2014 8090 0018
3613120  0280 0004 0100 0000 7ffa 9ba4 9010 0018 7ffd 87a6 9010 001d 1080 0008 b010 2000 fa26 0000 c026 2004 c026 2008 e007 bff0
3613200  e026 200c c026 2010 81c7 e008 81e8 0000 9de3 bfa0 b810 2000 d006 2008 8090 0008 2280 000b e206 2004 d206 2014 fa06 2004
3613260  f806 2004 ba02 401d fa17 6008 de06 2004 9e03 c01d de26 2004 e206 2004 e406 2008 80a4 4012 2680 0005 e606 2008 c026 2008
3613340  c026 2004 e606 2008 8090 0013 3280 0011 ea06 2014 d006 0000 d206 2014 4000 0699 d406 200c 8090 0008 1480 0009 d026 2008
3613420  e806 2008 8090 0014 1280 0003 0100 0000 f826 2004 1080 0011 b010 2000 ea06 2014 fa06 2004 ba05 401d f217 6008 8090 0019
3613500  3280 0004 f607 6004 1080 0008 b010 2000 8090 001b 22bf ffd2 d006 2008 d007 4000 d026 2010 b010 001d 81c7 e008 81e8 0000
3613560  94a2 a001 2c80 000e 8090 000a da4a 4000 d64a 0000 80a2 c00d 1280 0008 9202 6001 d84a 0000 8090 000c 12bf fff6 9002 2001
3613640  1080 000a 9010 2000 8090 000a 3680 0004 9222 6001 1030 0005 9010 2000 d24a 4000 d04a 0000 9022 0009 81c3 e008 0100 0000
3613720  9810 0008 94a2 a001 0c80 000e 0100 0000 da4a 4000 da2a 0000 8090 000d 9202 6001 12bf fff9 9002 2001 94a2 a001 2cbf fff7
3614000  94a2 a001 c02a 0000 10bf fffc 9002 2001 81c3 e008 9000 000c 9de3 bfa0 8090 0019 0280 0003 ac10 2000 f026 4000 8090 001a
3614060  0680 0004 80a6 a024 2480 0004 fa4e 0000 1080 0088 b010 2000 1500 0292 b802 a131 d64f 401c 808a e007 3280 0011 8090 001a
3614140  da4f 401c 808b 6008 2280 0008 80a7 602b b006 2001 10bf fffb fa4e 0000 b006 2001 1080 0006 fa4e 0000 02bf fffd 80a7 602d
3614220  22bf fffb ac10 2001 8090 001a 3280 0010 b807 401c 80a7 6030 2280 0004 e84e 2001 1080 000a b410 200a 80a5 2078 0280 0006
3614300  0100 0000 d04e 2001 80a2 2058 3280 0003 b410 2038 b410 2010 b807 401c d64f 0000 808a e007 0280 0013 0100 0000 de4f 0000
3614360  1b00 0292 9a13 6131 808b e004 0280 0004 ae10 000d 1080 0008 b827 6030 f84f 0000 ae10 000d 808f 2002 2280 0003 b827 6037
3614440  b827 6057 80a7 001a 2680 0004 80a6 a010 1080 004c b010 2000 3280 0015 b807 4017 80a7 6030 3280 0012 b807 4017 d44e 2002
3614520  d44a 8017 808a a040 2280 000d b807 4017 da4e 2001 80a3 6078 2280 0007 b006 2002 e04e 2001 80a4 2058 3280 0005 b807 4017
3614600  b006 2002 fa4e 0000 b807 4017 ea4f 0000 808d 6004 2280 0004 f84f 0000 1080 0009 ba27 6030 1500 0292 808f 2002 0280 0004
3614660  ae02 a131 1080 0003 ba27 6057 ba27 6037 b006 2001 b620 001d fa4e 0000 b807 4017 e84f 0000 808d 2007 2280 001b 8090 0019
3614740  d04f 0000 808a 2004 2280 0004 f84f 0000 1080 0006 ba27 6030 808f 2002 2280 0003 ba27 6037 ba27 6057 80a7 401a 3680 000e
3615020  8090 0019 9210 001b 7ffe 0808 9010 001a b622 001d b006 2001 fa4e 0000 b807 4017 e84f 0000 808d 2007 32bf ffeb d04f 0000
3615100  8090 0019 2280 0004 8090 0016 f026 4000 8090 0016 2280 0003 b020 001b b010 001b 81c7 e008 81e8 0000 9de3 bfa0 1100 05de
3615160  d002 205c 8090 0008 3280 0008 1100 05de 9210 2100 7ffa 9bdd 9010 2001 1300 05de d022 605c 1100 05de d002 205c 7fff f14f
3615240  9210 0018 8090 0008 3280 0007 1900 05de 1500 05de d402 a050 1700 05de 1080 0013 d422 e054 d803 2050 8090 000c 2280 0005
3615320  9210 2000 4000 000f 0100 0000 9210 2000 4000 004e 9010 0018 1b00 05de da03 6050 1f00 05de da23 e054 1100 05de d002 205c
3615400  7fff a6b0 9210 0018 81c7 e008 91e8 2000 9de3 bfa0 1100 05de fa02 2050 8090 001d 2280 001b 1900 05de d207 6004 8090 0009
3615460  2280 0005 d407 6008 7ffa 9a6c d007 6004 d407 6008 8090 000a 2280 0005 d607 4000 7ffa 9a66 d007 6008 d607 4000 8090 000b
3615540  0280 0004 0100 0000 7ffa 9a60 d007 4000 7ffa 9a5e 9010 001d fa07 600c 8090 001d 32bf ffeb d207 6004 1900 05de c023 2050
3615620  1b00 05de c023 6054 1f00 05de de03 e05c 9090 000f 0280 0005 2100 05de 7ffa 9a4f d004 205c c024 205c 81c7 e008 91e8 2000
3615700  1900 05de d803 2054 8090 000c 3280 0004 1900 05de 1080 000f 9010 2000 c203 2054 c200 4000 c222 0000 d603 2054 9010 2001
3615760  d602 e004 d622 4000 da03 2054 da03 6008 da22 8000 c403 2054 c400 a00c c423 2054 81c3 e008 0100 0000 9de3 bf98 4000 00bb
3616040  9010 0018 b610 0008 8090 001b 0280 0076 ba10 0019 8090 001d 2280 0012 b807 bff8 d007 4000 7fff f0e5 9210 0018 8090 0008
3616120  3280 0008 fa07 6004 1300 05c2 1100 0294 9410 0018 9212 6010 1080 0065 9012 2370 8090 001d 32bf fff4 d007 4000 b807 bff8
3616200  f027 0000 f227 2004 ba10 001b 8090 001d 0280 005d 0100 0000 d24f 4000 80a2 6020 2280 0007 ba07 6001 d64f 4000 80a2 e009
3616260  3280 000c da4f 4000 ba07 6001 d24f 4000 80a2 6020 22bf fffe ba07 6001 d64f 4000 80a2 e009 22bf fffa ba07 6001 da4f 4000
3616340  8090 000d 0280 0048 0100 0000 e04f 4000 80a4 2023 0280 0044 0100 0000 e44f 4000 80a4 a028 3280 001e 1300 05c2 7ffa 9920
3616420  9010 2010 b010 0008 9007 6001 9210 0018 4000 003b 9410 202c 8090 0008 2280 002b 1300 0294 9410 202c 4000 0035 9206 2004
3616500  8090 0008 2280 0025 1300 0294 9410 2029 4000 002f 9206 2008 ba10 0008 8090 001d 2280 001e 1300 0294 1100 05de ea02 2050
3616560  ea26 200c 1080 0013 f022 2050 9212 6036 4000 0fa0 9010 001d b010 0008 8090 0018 2280 0007 9210 001c ee4e 0000 80a5 e023
3616640  0280 0019 0100 0000 9210 001c 9010 001d 7fff ff9a c02e 0000 9010 2020 d02e 0000 1300 05c2 9212 603b 4000 0f8e 9010 001d
3616720  10bf ffaf ba10 0008 ba02 6370 1300 05c2 9212 603e 4000 0497 9010 001d 1300 05c2 9212 605d 9010 001d 9410 001b 4000 0491
```

```
3617000  0100 0000 81c7 e008 81e8 0000 9de3 bfa0 d24e 0000 b52e a018 80a2 6020 0280 0006 b53e a018 d64e 0000 80a2 e009 3280 000c
3617060  9010 0018 b006 2001 d24e 0000 80a2 6020 22bf fffe b006 2001 d64e 0000 80a2 e009 22bf fffa b006 2001 9010 0018 4000 0f4f
3617140  9210 001a ba10 0008 8090 001d 3280 0004 80a6 001d 1080 0023 b010 2000 3280 0004 b427 6001 1080 001e c026 4000 de4e 8000
3617220  80a3 e020 2280 0007 b426 a001 e24e 8000 80a4 6009 3280 000c b426 8018 b426 a001 de4e 8000 80a3 e020 22bf fffe b426 a001
3617300  e24e 8000 80a4 6009 22bf fffa b426 a001 b426 8018 b406 a001 7ffa 98ad 9006 a001 d026 4000 d006 4000 921c 0018 7fff fe39
3617360  9410 001a f206 4000 c02e 401a b007 6001 81c7 e008 81e8 0000 9de3 bf98 1100 05de d002 2058 8090 0008 1280 0005 1100 05de
3617440  9012 2058 4000 0871 9210 2000 7fff 8515 9010 0018 961c 0008 1100 05de d002 2058 1300 05c2 9212 6000 9410 0018 9807 bffc
3617520  4000 0bbd 9a07 bff8 8090 0008 2280 0003 f007 bffc b010 2000 81c7 e008 81e8 0000 6e65 7467 726f 7570 0000 0000 0000 0000
3617600  4379 636c 6520 6465 7465 6374 6564 2069 6e20 2f65 7463 2f6e 6574 6772 6f75 703a 2025 732e 0a00 2009 0a23 0020 0900 7379
3617660  6e74 617a 2065 7272 6f72 2069 6e20 2f65 7463 2f6e 6574 6772 6f75 700a 002d 2d2d 2025 730a 0000 0000 9de3 bf98 9007 bffc
3617740  4000 0842 9210 2000 8090 001b 0280 0022 8090 001a 0280 0011 8090 0019 3280 000f 8090 0019 d007 bffc 1300 05c4 9212 6140
3620020  9810 001b 9410 0018 9610 001a 4000 01d0 9a07 bff8 8090 0008 0280 0013 0100 0000 1080 0033 fa07 bff8 0280 000f 8090 001a
3620100  1280 000d 0100 0000 d007 bffc 1300 05c4 9212 6150 9810 001b 9410 0018 9610 0019 4000 01bf 9a07 bff8 8090 0008 3280 0024
3620160  fa07 bff8 7ffa 9846 9010 2018 ba10 0008 8090 001d 3280 0004 f227 6004 1080 001c ba10 2000 f427 4000 f627 6008 d007 bffc
3620240  9210 2004 d027 6014 7ffa 9a54 9010 20c8 d027 600c d207 600c d227 6010 d407 600c 8090 000a 3280 0006 9210 0018 7ffa 9907
3620320  9010 001d 1080 000a ba10 2000 4000 000a 9010 001d d027 bff8 7ffa 9900 d007 600c 7ffa 98fe 9010 001d fa07 bff8 81c7 e008
3620400  91e8 001d 9de3 bf98 d006 2010 9002 2004 d026 2010 f222 3ffc d406 200c d806 2010 9402 a320 80a3 000a 0880 000a 1300 05c4
3620460  1100 0294 9012 2370 4000 03c2 9212 6160 da06 2010 9a23 6004 1080 0159 da26 2010 7fff 848c 9010 0019 9610 0008 d006 2014
3620540  1300 05c4 9212 617e 9410 0019 9807 bffc 4000 0b35 9a07 bff8 8090 0008 2280 0006 fa06 200c e006 2010 a024 2004 1080 0148
3620620  e026 2010 e406 2010 a424 a004 80a7 4012 3a80 001b fa07 bffc d007 4000 7fff ef8b 9210 0019 8090 0008 3280 000f e406 2010
3620700  1300 05c4 1100 0294 9012 2370 9212 6187 4000 039c 9410 0019 e806 2010 a825 2004 e826 2010 7ffa 98c1 d007 bffc 1080 0131
3620760  ba10 2000 ba07 6004 a424 a004 80a7 4012 2abf ffeb d007 4000 fa07 bffc ec07 bff8 8090 001d 0280 0121 c02f 4016 ee4f 4000
3621040  b810 2000 80a5 e020 2280 0007 ba07 6001 d04f 4000 80a2 2009 3280 000c d44f 4000 ba07 6001 ee4f 4000 80a5 e020 22bf fffe
3621120  ba07 6001 d04f 4000 80a2 2009 22bf fffa ba07 6001 d44f 4000 8090 000a 0280 010b 0100 0000 d84f 4000 80a3 2023 0280 0107
3621200  0100 0000 de4f 4000 80a3 e028 3280 00db 1300 05c4 ba07 6001 e44f 4000 80a4 a020 2280 0007 ba07 6001 e84f 4000 80a5 2009
3621260  3280 000c 9210 202c ba07 6001 e44f 4000 80a4 a020 22bf fffe ba07 6001 e84f 4000 80a5 2009 22bf fffa ba07 6001 9210 202c
3621340  4000 0e2e 9010 001d b210 0008 8090 0019 1280 000e b610 0019 1300 05c4 1100 0294 9012 2370 4000 034f 9212 61b1 ec06 2010
3621420  ac25 a004 ec26 2010 7ffa 9874 d007 bffc 1080 00e4 ba10 2000 80a7 4019 2280 001f b810 2001 f406 2004 8090 001a 2280 001b
3621500  b810 2001 d04e 7fff 80a2 2020 2280 0007 b226 6001 d44e 7fff 80a2 a009 3280 000c d006 2004 b226 6001 d04e 7fff 80a2 2020
3621560  22bf fffe b226 6001 d44e 7fff 80a2 a009 22bf fffa b226 6001 d006 2004 9210 001d 7fff fcf8 9426 401d 8090 0008 3280 0004
3621640  ba06 e001 b810 2001 ba06 e001 da4f 4000 80a3 6020 2280 0007 ba07 6001 e04f 4000 80a4 2009 3280 000c 9210 202c ba07 6001
3621720  da4f 4000 80a3 6020 22bf fffe ba07 6001 e04f 4000 80a4 2009 22bf fffa ba07 6001 9210 202c 4000 0de9 9010 001d b210 0008
3622000  8090 0019 1280 000e b610 0019 1300 05c4 1100 0294 9012 2370 4000 030a 9212 61da e406 2010 a424 a004 e426 2010 7ffa 982f
3622060  d007 bffc 1080 009f ba10 2000 80a7 4019 2280 001f b807 2001 e806 0000 8090 0014 2280 001b b807 2001 ea4e 7fff 80a5 6020
3622140  2280 0007 b226 6001 ee4e 7fff 80a5 e009 3280 000c d006 0000 b226 6001 ea4e 7fff 80a5 6020 22bf fffe b226 6001 ee4e 7fff
3622220  80a5 e009 22bf fffa b226 6001 d006 0000 9210 001d 7fff fcb3 9426 401d 8090 0008 3280 0004 ba06 e001 b807 2001 ba06 e001
3622300  d24f 4000 80a2 6020 2280 0007 ba07 6001 d64f 4000 80a2 e009 3280 000c 9210 2029 ba07 6001 d24f 4000 80a2 6020 22bf fffe
3622360  ba07 6001 d64f 4000 80a2 e009 22bf fffa ba07 6001 9210 2029 4000 0da4 9010 001d b210 0008 8090 0019 1280 000e b610 0019
3622440  1300 05c4 1100 0294 9012 2370 4000 02c5 9212 6203 da06 2010 9a23 6004 da26 2010 7ffa 97ea d007 bffc 1080 005a ba10 2000
3622520  80a7 4019 2280 001f b807 2001 e006 2008 9090 0010 2280 001b b807 2001 e24e 7fff 80a4 6020 2280 0007 b226 6001 e64e 7fff
3622600  80a4 e009 3280 000c d006 2008 b226 6001 e24e 7fff 80a4 6020 22bf fffe b226 6001 e64e 7fff 80a4 e009 22bf fffa b226 6001
3622660  d006 2008 9210 001d 7fff fc6e 9426 401d 8090 0008 3280 0004 80a7 2003 b807 2001 80a7 2003 1280 0029 ba06 e001 7ffa 97c3
3622740  d007 bffc ec06 2010 ba10 2001 ac25 a004 1080 0030 ec26 2010 9212 622c 4000 0d81 9010 001d b210 0008 8090 0019 2280 0007
3623020  8090 0019 f44e 4000 80a6 a023 0280 001f 0100 0000 8090 0019 2280 0004 9210 001d c02e 4000 9210 001d 7fff feb3 9010 0018
3623100  8090 0008 2280 0009 8090 0019 7ffa 97a7 d007 bffc d206 2010 ba10 2001 9222 6004 1080 0014 d226 2010 2280 0005 1300 05c4
3623160  9610 2020 d62e 4000 1300 05c4 9212 6231 4000 0d60 9010 001d ba10 0008 8090 001d 32bf fee4 ee4f 4000 7ffa 9794 d007 bffc
3623240  d806 2010 9823 2004 d826 2010 ba10 2000 81c7 e008 91e8 001d 9de3 bfa0 7fff 8331 9010 0018 b810 0008 9410 001c 9210 0019
3623320  7fff fc28 9010 0018 8090 0008 3280 000d da4e 4000 ba06 401c d24f 4000 80a2 602c 0280 0006 0100 0000 fa4f 4000 80a7 600a
3623400  3280 0004 da4e 4000 1080 0013 b210 2001 80a3 602c 2280 000b b206 6001 e04e 4000 80a4 200a 0280 0007 b206 6001 da4e 4000
3623460  80a3 602c 32bf fffb e04e 4000 b206 6001 e44e 4000 8090 0012 32bf ffe1 9410 001c b210 2000 81c7 e008 91e8 0019 9de3 be98
3623540  1100 05c4 aa02 2234 ac10 2000 ae07 bf00 80a5 a003 1880 001b 912d a002 1300 05c4 9212 6020 d002 0009 81c2 0000 0100 0000
3623620  0017 1030 0017 1040 0017 1050 0017 105c 9010 0017 9210 001b 1080 000c 9410 001c 9010 0017 9210 0015 1080 0008 9410 001c
3623700  9010 0017 1080 0004 9210 001b 9210 0015 9010 0017 9410 0015 4000 0026 0100 0000 7fff 82e8 9010 0017 9610 0008 9010 0018
3623760  9210 0019 9410 0017 9807 befc 4000 0992 9a07 bef8 a810 0008 8090 0014 3280 000e 80a5 2005 d207 befc 7fff ffa8 9010 001a
3624040  d027 4000 7ffa 9731 d007 befc d407 4000 8090 000a 2280 0008 ac05 a001 1080 000b ae10 2001 2280 0004 ac05 a001 1080 0007
```

```
3624120 ae10 2000 80a5 a004 26bf ffc7 80a5 a003 c027 4000 ae10 2001 81c7 e008 91e8 0017 da4a 4000 da2a 0000 8090 000d 9202 6001
3624200 12bf fffc 9002 2001 9610 202e d62a 3fff d24a 8000 d22a 0000 8090 0009 94c2 a001 12bf fffc 9002 2001 81c3 e008 9000 2000
3624260 6e65 7467 726f 7570 2e62 7975 7365 720c 6e65 7467 726f 7570 2e62 7968 6f73 7400 696e 6e65 7467 723a 2072 6563 7572 7369
3624340 7665 206f 7665 7266 6c6f 770d 0a00 6e65 7467 726f 7570 0069 6e6e 6574 6772 3a20 6e65 7467 726f 7570 2025 7320 6361 6c6c
3624420 6564 2072 6563 7572 7369 7665 6c79 0d0a 0069 6e6e 6574 6772 3a20 7379 6e74 6178 2065 7272 6f72 2069 6e20 2f65 7463 2f6e
3624500 6574 6772 6f75 700d 0a00 696e 6e65 7467 723a 2073 796e 7461 7820 6572 726f 7220 696e 202f 6574 632f 6e65 7467 726f 7570
3624560 0d0a 0069 6e6e 6574 6772 3a20 7379 6e74 6178 2065 7272 6f72 2069 6e20 2f65 7463 2f6e 6574 6772 6f75 700d 0a00 2009 0a23
3624640 0020 0900 2a00 0000 9de3 bfa0 d056 a010 ae10 0018 808a 2101 3280 0004 b826 6001 1080 0047 b410 2000 8090 001c 2480 0043
3624720 b410 0017 d606 8000 8090 000b 3480 0012 e206 8000 4000 00dd 9010 001a 80a2 3fff 3280 0007 d806 a004 80a5 c018 3280 0037
3625000 b410 0017 1080 0036 b410 2000 9823 2001 d826 a004 de06 8000 9e03 e001 de26 8000 e206 8000 80a7 0011 3680 0003 fa06 8000
3625060 ba10 001c d206 a004 9610 001d 9410 200a 4000 0c64 9010 0018 b210 001d ba10 0008 8090 001d 2280 0004 e606 8000 b227 4018
3625140 e606 8000 b006 0019 a624 c019 e626 8000 ea06 a004 aa05 4019 ea26 a004 d006 8000 8090 0008 3680 0003 f606 8000 b610 2000
3625220 d206 a008 d406 a00c d806 a004 9202 400a 9222 400c 80a2 401b 3680 0005 8090 001d 7fff 821a 9010 001a 8090 001d 3280 0007
3625300 b410 0017 b827 0019 8090 001c 34bf ffc3 d606 8000 b410 0017 c02e 0000 81c7 e008 91e8 001a 0000 0000 9de3 bfa0 d056 2010
3625360 b410 3fff 900a 3fef d036 2010 d456 2010 808a a001 2280 005f d056 2010 80a6 a002 3680 0036 ba10 2000 d806 2008 8090 000c
3625440 2280 0032 ba10 2000 da56 2010 808b 6004 1280 012e ba10 2000 f606 0000 8090 001a 1280 000f b810 0019 d04e 2012 9410 2001
3625520 4000 01c2 9210 2000 ba10 0008 80a7 7fff 3280 0004 b826 c01d 1080 001e b010 3fff ba0e 6001 1080 0004 b806 401c ba10 2000
3625600 b226 401b e656 2010 808c e100 3280 0018 d856 2010 8090 001b 2480 0015 d856 2010 80a7 001b 3480 0012 d856 2010 ea06 2008
3625660 ec06 2004 aa25 4016 80a7 0015 2680 000c d856 2010 d006 2004 9002 001c d026 2004 d406 0000 9422 801c d426 0000 b010 2000
3625740 81c7 e008 81e8 0000 d856 2010 808b 2100 2280 0009 d04e 2012 de06 2008 ba10 2000 de26 2004 e056 2010 a00c 3ffe e036 2010
3626020 d04e 2012 9410 001a 4000 0190 9226 401d 8090 001d c026 0000 0280 0031 b810 0008 80a7 3fff 2280 002f 80a7 3fff e406 0000
3626100 a4a4 a001 0c80 0007 e426 0000 e806 2004 a805 2001 e826 2004 1080 0005 f00d 3fff 4000 003e 9010 0018 b010 0008 80a6 3fff
3626160 3280 0020 80a7 3fff 1080 001d b910 3fff 808a 2102 2280 001b 80a7 3fff 7fff 805e 9010 0018 c026 0000 d456 2010 ba10 0008
3626240 808a a100 2280 0008 d04e 2012 d856 2010 980b 3ffd d836 2010 de06 2008 de26 2004 d04e 2012 9410 001a 4000 0164 9210 0019
3626320 80a2 3fff 0280 0004 80a7 7fff 32bf ffc1 b010 2000 10bf ffbf b010 3fff 80a7 3fff 32bf ffbc b010 2000 10bf ffba b010 3fff
3626400 9de3 bfa0 7fff 8040 9010 0018 d04e 2012 9210 2000 4000 0151 9410 2000 c026 0000 d006 2008 d026 2004 d256 2010 920a 7fcf
3626460 d236 2010 d656 2010 808a e100 0280 0005 0100 0000 da56 2010 9a0b 7ffc da36 2010 81c7 e008 81e8 0000 9de3 bfa0 d056 2010
3626540 808a 2001 3280 000a de56 2010 d456 2010 808a a100 2280 004a b010 3fff d856 2010 9813 2001 d836 2010 de56 2010 808b e050
3626620 3280 0043 b010 3fff e206 2008 8090 0011 3280 0005 2500 0294 7fff 8120 9010 0018 2500 0294 a414 a348 80a6 0012 3280 0011
3626700 ee06 2008 2700 0294 e654 e36c 808c e0d0 2280 0005 2b00 0294 7fff 800b 9004 a014 2b00 0294 ea55 6380 808d 6080 2280 0005
3626760 ee06 2008 7fff 8004 9004 a028 ee06 2008 ee26 2004 f256 2010 808e 6004 2280 0003 fa06 200c ba10 2001 d04e 2012 d206 2008
3627040 7fff a1de 9410 001d d026 0000 f606 0000 b6a6 e001 0c90 0007 f626 0000 d006 2004 9002 2001 d026 2004 1080 0015 f00a 3fff
3627120 d806 0000 80a3 3fff 2280 0006 e056 2010 da56 2010 9a13 6020 1080 000b da36 2010 a014 2010 e036 2010 e456 2010 808c a100
3627200 2280 0006 c026 0000 e856 2010 a80d 3ffe e836 2010 c026 0000 b010 3fff 81c7 e008 81e8 0000 0000 0000 9de3 bfa0 7fff 8297
3627260 0100 0000 9410 0008 9010 0018 4000 000d 9210 0019 81c7 e008 91e8 0008 9de3 bfa0 7fff 7fa6 9010 001a 9010 0018 9210 0019
3627340 4000 0004 9410 001a 81c7 e008 91e8 0008 9de3 bfa0 8090 001a 0280 0008 8090 0018 0280 0006 0100 0000 d04e 0000 8090 0008
3627420 3280 0004 d44e 6001 1080 0047 b410 2000 80a2 a02b 3280 0003 9810 2000 9810 2001 d04e 4000 b810 000c 80a2 2061 0280 000b
3627500 80a2 2072 0280 000f 80a2 2077 1280 0012 8090 001c 2280 0003 ba10 2001 ba10 2002 1080 000f ba17 6600 8090 001c 2280 0003
3627560 ba10 2001 ba10 2002 1080 0009 ba17 6200 8090 001c 3280 0006 ba10 2002 1080 0004 ba10 2000 1080 0028 b410 2000 9410 21b6
3627640 9210 001d 7ffd 8169 9010 0018 ba10 0008 8090 001d 3680 0004 8090 001c 1080 001e b410 2000 c026 8000 0280 0004 fa2e a012
3627720 1080 0007 b810 2100 e04e 4000 80a4 2072 3280 0003 b810 2002 b810 2001 f836 a010 f24e 4000 80a6 6061 3280 000d c026 a004
3630000 9410 2002 9210 2000 4000 0094 9010 001d 8090 0008 3680 0006 c026 a004 7ffd 8137 9010 001d 1080 0004 b410 2000 c026 a008
3630060 c026 a00c 81c7 e008 91e8 001a 0000 0000 9de3 bba0 fa27 a058 f427 a04c f627 a050 f827 a054 d256 2010 ba07 a04c 808a 6002
3630140 3280 000a e056 2010 d656 2010 808a e100 0280 001f 0100 0000 da56 2010 9a13 6002 da36 2010 e056 2010 808c 2004 2280 001a
3630220 9410 0018 e456 2010 a807 bc00 a40c bffb e436 2010 e826 2008 e826 2004 aa10 2400 ea26 200c 9410 0018 9210 001d 7fff 7a0b
3630300 9010 0019 ba10 0008 7fff 7f4f 9010 0018 ec56 2010 ac15 a004 ec36 2010 c026 2008 c026 200c 1080 0008 c026 0000 1080 0007
3630360 b010 3fff 9210 001d 7fff 79fc 9010 0019 ba10 0008 b010 001d 81c7 e008 81e8 0000 8210 2083 91d0 2000 1a80 0004 1b00 0345
3630440 9a13 61c0 81c3 4000 0100 0000 81c3 e008 0100 0000 0000 0000 8210 2082 91d0 2000 1a80 0004 1b00 0345 9a13 61c0 81c3 4000
3630520 0100 0000 81c3 e008 0100 0000 0000 0000 8210 20ae 91d0 2000 1a80 0004 1b00 0345 9a13 61c0 81c3 4000 0100 0000 81c3 e008
3630600 0100 0000 0000 0000 8210 2040 91d0 2000 1a80 0004 1b00 0345 9a13 61c0 81c3 4000 0100 0000 81c3 e008 0100 0000 0000 0000
3630660 8210 2014 91d0 2000 1a80 0004 1b00 0345 9a13 61c0 81c3 4000 0100 0000 81c3 e008 0100 0000 0000 0000 8210 2028 91d0 2000
3630740 1a80 0004 1b00 0345 9a13 61c0 81c3 4000 0100 0000 81c3 e008 0100 0000 0000 0000 8210 203c 91d0 2000 1a80 0004 1b00 0345
3631020 9a13 61c0 81c3 4000 0100 0000 81c3 e008 0100 0000 0000 0000 0320 0000 9610 400b 8210 2047 91d0 2000 1a80 0004 1b00 0345
3631100 9a13 61c0 81c3 4000 0100 0000 81c3 e008 0100 0000 0000 0000 8210 2013 91d0 2000 1a80 0004 1b00 0345 9a13 61c0 81c3 4000
3631160 0100 0000 81c3 e008 0100 0000 0000 0000 9de3 bf70 8090 0018 0280 0007 0100 0000 7fff 803c 9010 0018 8090 0008 1280 0004
```

```
3631240  0100 0000 1080 00a6 ba10 2001 4000 012b 0100 0000 1100 05de d04a 206c 8090 0008 3280 0029 9210 0019 4000 03af 0100 0000
3631320  1300 05ca 1500 05ca 9412 a281 9212 6278 9610 0018 7fff 7821 9810 2002 4000 03a6 0100 0000 7ffd 8095 9210 2000 1300 05de
3631400  80a2 3fff 0280 0017 d022 6070 1100 051e d002 2070 7fff ff7f 9210 2006 8090 0008 1290 0007 2100 05de 7ffd 8074 d004 2070
3631460  9410 3fff 1080 000b d424 2070 d004 2070 9410 2002 7fff a095 9207 bffe d817 bffe 1f00 05de d823 e074 7ffd 8068 d004 2070
3631540  9210 0019 4000 0115 9010 0018 8090 0008 3280 0073 ba10 2000 211f c000 a014 2001 2300 05de e024 6060 a410 2002 e427 bff4
3631620  f027 bff8 b610 2000 8090 001b 3280 0057 d207 bff4 2700 05de e604 e074 8090 0013 2280 000f d007 bff4 b810 2001 9207 bff0
3631700  4000 0156 9007 bfe0 9090 0008 3280 0021 2d00 05de e807 bff0 80a5 2007 3280 0016 6090 001c 1080 0056 ba10 0014 4000 0283
3631760  9207 bff0 ba10 0008 8090 001d 0280 000c b810 2000 80a7 6002 22bf ffee 9207 bff0 d007 bff4 4000 0279 9207 bff0 ba10 0008
3632040  8090 001d 32bf fff9 80a7 6002 1080 0044 fa07 bff0 32bf ffda 8090 001b 80a5 200a 32bf ffd7 8090 001b 1080 003d ba10 0014
3632120  ec05 a074 b810 2001 8090 0016 22bf ffd0 8090 001b 9410 001c 9a07 bff0 9807 bfd4 9607 bff8 9207 bff4 4000 01c2 9007 bfe0
3632200  ba10 0008 8090 001d 0280 0018 80a7 6002 0280 0018 0100 0000 2400 05de ec05 a074 b807 2001 8090 0016 22bf ffbd 8090 001b
3632260  80a7 6002 22bf ffba 8090 001b 9410 001c 9a07 bff0 9807 bfd4 9607 bff8 9207 bff4 4000 01ac 9007 bfe0 ba10 0008 8090 001d
3632340  12bf ffec 80a7 6002 1080 0015 fa07 bff0 10bf ffea b610 2001 9410 0018 9607 bff0 4000 0253 9007 bfd4 ba10 0008 8090 001d
3632420  3280 0004 ee07 bff4 1080 0009 fa07 bff0 80a5 e001 3280 0005 fa26 4000 4000 02ae 9010 001d fa26 4000 ba10 2000 81c7 e008
3632500  91e8 001d 9de3 bf98 9207 bffc 7fff ff4d 9010 0018 81c7 e008 91e8 0008 9de3 bf88 8090 0018 0280 004b b810 2000 7fff 7f85
3632560  9010 0018 8090 0008 0280 0046 1300 05de 9010 2001 d02a 606c 1500 05de fa02 a064 8090 001d 0280 003f 9010 0018 7fff ea8f
3632640  9207 6004 8090 0008 3280 0036 b810 001d 9610 2010 d627 bffc d007 605c 9407 bffc 4000 12f4 9207 bfec 8090 0008 3280 000c
3632720  f007 605c d857 bfec 80a3 2002 3280 0008 f007 605c e017 6064 de17 bfee 80a3 c010 2280 0010 c207 6060 f007 605c 4000 12bd
3633000  9010 0018 c207 6060 b610 0008 c200 6004 c200 6010 9fc0 4000 d007 6060 9010 001b 4000 12be 9210 0018 1080 0007 9010 001b
3633060  c200 6004 c200 6010 9fc0 4000 d007 6060 d007 605c 7ffd 7fad 2b00 05de ea05 6064 80a7 4015 3280 0006 f207 4000 ec07 4000
3633140  2f00 05de 1080 0003 ec25 e064 f227 0000 7ffa 919e 9010 001d 1080 0006 0100 0000 fa07 4000 8090 001d 32bf ffc5 9010 0018
3633220  81c7 e008 81e8 0000 9de3 bea0 1100 05de d002 2068 8090 0008 2280 0005 ba07 bf00 1300 05de 1080 001c fa02 6068 9010 001d
3633300  4000 12aa 9210 2100 8090 0008 3280 0016 ba10 2000 7fff 7f2b 9010 001d 8090 0008 2480 0011 ba10 2000 7fff 7f26 9010 001d
3633360  7ffa 92a7 9002 2001 1300 05de d022 6068 d202 6068 8090 0009 2280 0007 ba10 2000 2100 05de d004 2068 7fff 9faa 9210 001d
3633440  fa04 2068 81c7 e008 91e8 001d 9de3 bfc0 7fff ffda 0100 0000 8090 0008 0280 0004 d026 0000 1080 0003 b010 2000 b010 2006
3633520  81c7 e008 81e8 0000 9de3 bfa0 7fff fe95 0100 0000 ba10 0008 1100 05de d002 2078 80a7 4008 0280 000f 1300 05de fa22 6078
3633600  1500 05de d402 a064 8090 000a 0280 0009 2100 05de d004 2064 7fff ff71 9002 2004 e004 2064 8090 0010 32bf fffb 2100 05de
3633660  81c7 e008 81e8 0000 9de3 bf88 1100 05de fa02 2064 8090 001d 2280 0024 ba10 2000 9010 0018 7fff ea01 9207 6004 8090 0008
3633740  3280 001a fa07 4000 9210 2010 d227 bffc d007 605c 9207 bfec 4000 1266 9407 bffc 8090 0008 1280 000b 0100 0000 d457 bfec
3634020  80a2 a002 1280 0007 0100 0000 da17 6064 d817 bfee 80a3 000d 2280 0006 fa26 4000 7fff ff4b 9010 0018 1080 0008 ba10 2000
3634100  1080 0006 ba10 2001 8090 001d 32bf ffe2 9010 0018 ba10 2000 81c7 e008 91e8 001d 9de3 bfa0 1300 05de d202 6060 9006 2004
3634160  d222 2000 9810 2002 d836 0000 9a10 206f da36 2002 9006 2008 7ffa 9436 9210 2008 1f00 05de de03 e070 80a3 ffff 3280 001d
3634240  b010 2001 9410 2000 9210 2001 4000 1289 9010 2002 ba10 0008 80a7 7fff 3280 0006 9410 2010 a010 2007 b010 2000 1080 0011
3634320  e026 4000 9210 0019 4000 11fc 9010 001d 8090 0008 1680 0008 0100 0000 7ffd 7f03 9010 001d a210 2009 b010 2000 1080 0005
3634400  e226 4000 7ffd 7efd 9010 001d b010 2001 81c7 e008 81e8 0000 9de3 bfa0 1100 05de d002 2074 8090 0008 2280 0042 b010 2000
3634460  1500 05de d402 a060 9206 2004 d422 6000 9a10 2002 da36 0000 1f00 05de de03 e074 9210 2008 9006 2008 de36 2002 7ffa 9401
3634540  0100 0000 9010 2002 9210 2002 4000 1259 9410 2000 ba10 0008 80a7 7fff 3280 0007 2500 0295 2100 05de c024 2074 a210 2007
3634620  1080 0027 e226 4000 c024 a1c8 9410 2010 9210 0018 4000 11bf 9010 001d b010 0008 7ffd 7ed2 9010 001d 80a6 3fff 3280 0019
3634700  2100 05de 2700 0295 e604 e1c8 80a4 e030 3280 0004 2900 0295 1080 0016 b010 2001 e805 21c8 80a5 200d 3280 000e 2d00 05de
3634760  2b00 05de ea05 6074 80a5 6400 3a80 0009 2d00 05de 7ffd 7ccf 0100 0000 8090 0008 2280 0004 2d00 05de 1080 0006 b010 2001
3635040  c025 a074 ae10 200a ee26 4000 b010 2000 81c7 e008 81e8 0000 9de3 bf80 1100 05de c022 2074 1100 0061 9012 22a7 9610 2011
3635120  9810 3fff 9a10 2190 da23 a05c d827 bfec 1627 bff8 d027 bff0 1f00 05ca f227 bff4 c027 bffc 9e13 e254 e003 c000 de03 e004
3635200  9603 a060 e022 e000 9202 3ff9 9010 0018 9807 bfec 9a10 2190 9410 2002 de22 e004 4000 0ae2 0100 0000 b010 0008 8090 0018
3635260  3280 0006 c206 2004 a410 2002 b010 2000 1080 002e e426 8000 2b00 05ca c200 4000 aa15 625c ec05 4000 ea05 6004 a803 a060
3635340  ec25 2000 ea25 2004 1b00 05de 1900 0547 1500 05d6 e823 a05c 9412 a238 9813 23b8 9a13 6074 9010 0018 9210 2003 9fc0 4000
3635420  9607 bff0 c206 2004 b210 0008 c200 6010 9fc0 4000 9010 0018 7ffd 7e74 d007 bfec 8090 0019 3280 000c 1100 05ca 3b00 05de
3635500  fa07 6074 8090 001d 2280 0004 9010 200a 1080 000a b010 2002 b010 2000 1080 0007 d026 8000 4000 0a4f d002 2250 9210 2002
3635560  d226 8000 b010 2001 81c7 e008 81e8 0000 9de3 bf90 1100 05de d002 2070 80a2 3fff 2280 0025 9810 3fff 1300 05de d24a 606c
3635640  8090 0009 3280 0020 9810 3fff 4000 0176 0100 0000 7ffd 7e65 9210 2000 1300 05de d022 6070 d202 6070 80a2 7fff 2280 0058
3635720  8090 001b 1100 05de d002 2070 7fff fd4d 9210 2006 8090 0008 2280 0051 8090 001b 2100 05de d004 2070 9410 2000 7fff fd97
3636000  9210 2002 d004 2070 9210 001c 7fff 9e63 9410 200c 7ffd 7e39 d004 2070 1080 0043 b610 2000 d827 bffc da06 4000 80a3 6002
3636060  3280 0008 2500 05ca 80a6 a001 2480 0005 2500 05ca a010 2001 e026 4000 2500 05ca a210 2190 e223 a05c a414 a254 e604 8000
3636140  e404 a004 9603 a060 e622 e000 e422 e004 d406 4000 1300 0061 9212 62a7 9a10 2190 9010 0018 4000 0a69 9807 bffc b010 0008
3636220  8090 0018 3280 0006 c206 2004 aa10 2002 b210 2000 1080 0053 ea27 4000 1100 05ca c200 4000 9012 225c d202 0000 d002 2004
3636300  ae03 a060 d225 e000 d025 e004 1900 05cf 1500 05cf ee23 a05c 9412 a080 9813 2248 9010 0018 9210 2001 9a10 001c 9fc0 4000
```

| | | | | | | | | | | | | | | | | | | | | | | | |
|---|---|---|---|---|---|---|---|---|---|---|---|---|---|---|---|---|---|---|---|---|---|---|---|
| 3636360 | 9610 | 001b | c206 | 2004 | b610 | 0008 | c200 | 6010 | 9fc0 | 4000 | 9010 | 0018 | 7ffd | 7dfc | d007 | bffc | 8090 | 001b | 2280 | 0003 | b010 | 2000 | b010 | 2001 |
| 3636440 | 1b00 | 05de | f02b | 606c | 8090 | 001b | 3280 | 001b | 80a6 | e009 | f807 | 0000 | 80a7 | 2001 | 3280 | 0004 | e006 | 4000 | 1080 | 002b | b210 | 2002 | 80a4 | 2002 |
| 3636520 | 3280 | 0006 | f206 | 4000 | 80a6 | a001 | 2680 | 0007 | 1100 | 05ca | f206 | 4000 | 80a6 | 6001 | 3280 | 0006 | 2b00 | 05de | 1100 | 05ca | 4000 | 09ca | d002 | 2250 |
| 3636600 | 2b00 | 05de | a810 | 2001 | e82d | 506c | ac10 | 2003 | 1080 | 0017 | ec27 | 4000 | 1100 | 05de | ae10 | 2001 | 1280 | 000c | ee2a | 206c | d206 | 4000 | 80a2 | 6001 |
| 3636660 | 3280 | 0006 | 9810 | 2001 | 9610 | 200a | b210 | 2000 | 1080 | 000c | d627 | 4000 | 1080 | 0007 | d826 | 4000 | 1100 | 05ca | 4000 | 09b3 | d002 | 2250 | 1b00 | 05de |
| 3636740 | c023 | 6074 | 9e10 | 2002 | de27 | 4000 | b210 | 2001 | 81c7 | e008 | 91e8 | 0019 | 9de3 | bf90 | 1100 | 05de | d002 | 2074 | 8090 | 0008 | 2280 | 0004 | 9210 | 0019 |
| 3637020 | 1080 | 000d | b210 | 2002 | 7fff | fe92 | 9007 | bff0 | 8090 | 0008 | 3280 | 0004 | 9410 | 0019 | 1080 | 0006 | b210 | 2000 | 9210 | 0018 | 7fff | ff00 | 9007 | bff0 |
| 3637100 | b210 | 0008 | 81c7 | e008 | 91e8 | 0019 | 9de3 | bf70 | 9010 | 2010 | d027 | bffc | 7ffa | 90c3 | 9010 | 206c | ba10 | 0008 | 8090 | 001d | 3280 | 0009 | 9606 | 2004 |
| 3637160 | 1300 | 05ca | 9212 | 6291 | 4000 | 079c | 9010 | 2003 | 9210 | 2007 | 1080 | 0055 | d226 | c000 | d602 | c000 | 9407 | 604c | d622 | a000 | 9e10 | 2002 | de37 | 6048 |
| 3637240 | e016 | 2008 | 9210 | 2008 | e037 | 604a | 7ffa | 92ad | 9007 | 6050 | f016 | 2008 | 80a6 | 6001 | f037 | 6058 | a410 | 3fff | 1280 | 0004 | e427 | 605c | 1080 | 0003 |
| 3637320 | b010 | 2001 | b010 | 2002 | 80a6 | 6002 | 1280 | 0004 | f027 | 6068 | 1080 | 0003 | b010 | 2002 | b010 | 2001 | 2d00 | 05ca | aa10 | 2640 | ea23 | a05c | ac15 | a264 |
| 3637400 | ee05 | 8000 | ec05 | a004 | 9603 | a060 | ee22 | e000 | 1300 | 0061 | 9212 | 62a4 | ec22 | e004 | 9a10 | 2190 | 9410 | 0018 | 9807 | 605c | 4000 | 09c0 | 9007 | 6048 |
| 3637460 | 8090 | 0008 | 1280 | 0007 | d027 | 6060 | 7ffa | 916b | 9010 | 001d | 9010 | 2002 | 1080 | 0024 | d026 | c000 | d007 | 605c | 9410 | 2001 | 4000 | 107a | 9210 | 2002 |
| 3637540 | 9007 | bfec | 7ffa | 927f | 9210 | 2010 | 9210 | 2002 | d237 | bfec | d007 | 605c | 9207 | bfec | 4000 | 1049 | 9410 | 2010 | d007 | 605c | 9207 | bfdc | 4000 | 1081 |
| 3637620 | 9407 | bffc | 8090 | 0008 | 1280 | 000c | 0100 | 0000 | d417 | bfde | 9210 | 001a | d437 | 6064 | 7fff | 9d85 | 9007 | 6004 | 1100 | 05de | d802 | 2064 | d827 | 4000 |
| 3637700 | 1080 | 0007 | fa22 | 2064 | 7ffa | 9148 | 9010 | 001d | 9610 | 2006 | d626 | c000 | ba10 | 2000 | 81c7 | e008 | 91e8 | 001d | 9de3 | bf90 | 9210 | 2640 | d223 | a05c |
| 3637760 | 9010 | 3fff | d027 | bffc | 1500 | 05ca | 9412 | a264 | d802 | 8000 | d402 | a004 | 9603 | a060 | d822 | e000 | d422 | e004 | 1300 | 0061 | 9212 | 62a4 | 9410 | 2002 |
| 3640040 | 9807 | bffc | 9006 | 2048 | 4000 | 0980 | 9a10 | 2190 | ba10 | 0008 | 8090 | 001d | 0280 | 002a | 0100 | 0000 | c207 | 6004 | 2300 | 05ca | c200 | 4000 | a214 | 626c |
| 3640120 | e404 | 4000 | e204 | 6004 | a003 | a060 | e424 | 2000 | 1900 | 05d7 | 9913 | 2310 | e224 | 2004 | e023 | a05c | 9410 | 000c | 9a10 | 2000 | 9610 | 2000 | 9210 | 2000 |
| 3640200 | 9fc0 | 4000 | 9010 | 001d | 8090 | 0008 | 3280 | 000f | c207 | 6004 | c206 | 2060 | b210 | 2002 | c200 | 6004 | c200 | 6010 | 9fc0 | 4000 | d006 | 2060 | 7ffd | 7d13 |
| 3640260 | d006 | 205c | fa26 | 2060 | ee07 | bffc | ee26 | 205c | 1080 | 0008 | f226 | 2069 | 9010 | 001d | c200 | 6010 | 9fc0 | 4000 | 0100 | 0000 | 7ffd | 7d08 | d007 | bffc |
| 3640340 | 91c7 | e008 | 91e8 | 0000 | 9de3 | bf90 | 7fff | fd6b | c027 | bffc | 8090 | 0008 | 2280 | 0021 | b010 | 2000 | 9010 | 3fff | d02f | bffb | 1300 | 05de | d002 | 6068 |
| 3640420 | 9210 | 0019 | d026 | 0000 | 9610 | 2001 | 9807 | bffc | 9a07 | bff4 | 4000 | 0348 | 9407 | bffb | d407 | bffc | b010 | 0008 | 8090 | 000a | 2280 | 0008 | 8090 | 0018 |
| 3640500 | 7ffa | 90ea | d007 | bffc | 1080 | 0004 | 8090 | 0018 | 1080 | 000b | b010 | 2001 | 02bf | fffe | 80a6 | 2005 | 02bf | fffc | 80a6 | 2008 | 02bf | fffa | 80a6 | 2010 |
| 3640560 | 02bf | fff8 | 0100 | 0000 | b010 | 2000 | 81c7 | e008 | 81e8 | 0000 | 9de3 | bfa0 | 1100 | 05de | d002 | 207c | 8090 | 0008 | 3280 | 0007 | 1500 | 05de | 7ffa | 8ffc |
| 3640640 | 9010 | 2060 | 1300 | 05de | d022 | 607c | 1500 | 05de | f002 | a07c | 81c7 | e008 | 81e8 | 0000 | 0000 | 0000 | 0000 | 0005 | 0000 | 001e | 0000 | 0000 | 0000 | 001e |
| 3640720 | 0000 | 0000 | 0000 | 0005 | 0000 | 0000 | 0000 | 0014 | 0000 | 0000 | 0000 | 0000 | 2573 | 2f25 | 732e | 2564 | 002f | 7661 | 722f | 7970 | 2f62 | 696e | 6469 | 6e67 |
| 3641000 | 006c | 6f61 | 645f | 646f | 6d5f | 6269 | 6e54 | 696e | 673a | 2020 | 6d61 | 6c6c | 6f63 | 2066 | 6169 | 6c75 | 7265 | 2e00 | 0000 | 0000 | 9de3 | bf88 | 8090 | 0019 |
| 3641060 | 0280 | 0004 | 8090 | 0018 | 1280 | 0004 | 0100 | 0000 | 1080 | 003c | b010 | 2001 | 7fff | 7c4e | 9010 | 0018 | ae10 | 0008 | 7fff | 7c4b | 9010 | 0019 | 8090 | 0017 |
| 3641140 | 0280 | 0008 | 80a5 | e040 | 1880 | 0006 | 8090 | 0008 | 0280 | 0004 | 80a2 | 2040 | 2880 | 0027 | 9010 | 0018 | 1080 | 002c | b010 | 2001 | d402 | a068 | 80a2 | a002 |
| 3641220 | 3280 | 0005 | 1f00 | 05cb | 1b00 | 05ca | 1080 | 0003 | ae03 | 63c9 | ae03 | e158 | 2100 | 05ca | fa23 | a060 | f823 | a05c | a014 | 226c | e204 | 0000 | e004 | 2004 |
| 3641300 | 9603 | a068 | e222 | e000 | e022 | e004 | d407 | bffc | 9a10 | 001b | 9810 | 001a | 9010 | 0018 | 9210 | 0019 | 8210 | 0017 | 9fc0 | 4000 | 0100 | 0000 | ae10 | 0008 |
| 3641360 | 80a5 | e002 | 3280 | 000f | b010 | 0017 | 7fff | fc98 | 9010 | 0018 | 1100 | 05ca | 4000 | 0866 | d002 | 2250 | 9010 | 0018 | 7fff | fbdb | 9207 | bffc | ae10 | 0008 |
| 3641440 | 8090 | 0017 | 22bf | ffd9 | d407 | bffc | b010 | 0017 | 81c7 | e008 | 81e8 | 0000 | 9de3 | bf78 | f627 | a050 | da07 | a050 | f027 | bff8 | f227 | bffc | c027 | bff0 |
| 3641520 | c027 | bfe8 | c027 | bff4 | c027 | bfec | c206 | a060 | 9803 | a060 | c200 | 6004 | c200 | 6004 | 1500 | 05cf | c200 | 4000 | de03 | 4000 | da03 | 6004 | de23 | 2000 | da23 | 2004 |
| 3641600 | d823 | a05c | d006 | a060 | 1900 | 05cf | 9813 | 2190 | 9a07 | bfe4 | 9412 | a110 | 9607 | bff8 | 9fc0 | 4000 | 9210 | 2004 | 8090 | 0008 | 0280 | 0004 | b610 | 2000 |
| 3641660 | 1080 | 0044 | b610 | 2002 | d007 | bfe4 | 80a2 | 2001 | 2280 | 0006 | ee07 | a05c | 4000 | 0fcc | 0100 | 0000 | b610 | 0008 | ee07 | a05c | 8090 | 001b | 3280 | 0012 |
| 3641740 | 9090 | 001b | d007 | bfec | 7ffa | 8169 | 9002 | 2002 | 8090 | 0008 | 0280 | 000a | d027 | 0000 | d007 | bff4 | 7ffa | 8f63 | 9002 | 2002 | 8090 | 0008 | 1280 | 0005 |
| 3642020 | d025 | c000 | 7ffa | 9035 | d007 | 0000 | b610 | 2007 | 8090 | 001b | 3280 | 0020 | c206 | a060 | e607 | bfec | ac10 | 200a | e627 | 4000 | d007 | bfe8 | d407 | bfec |
| 3642100 | 4000 | 055e | d207 | 0000 | ea07 | bfec | e807 | 0000 | a010 | 200a | ec2d | 0015 | d207 | bfec | f807 | 0000 | b807 | 0009 | c02f | 2001 | d607 | a060 | d807 | bff4 |
| 3642160 | d822 | c000 | d007 | bff0 | d205 | c000 | 4000 | 054f | d407 | bff4 | da05 | c000 | de07 | bff4 | e02b | 400f | ee05 | c000 | e407 | bff4 | ae05 | c012 | c02d | e001 |
| 3642240 | c206 | a060 | 1300 | 05cf | c200 | 6004 | 9212 | 6190 | c200 | 600c | d006 | a060 | 9fc0 | 4000 | 9407 | bfe4 | 81c7 | e008 | 91e8 | 001b | 9de3 | bf90 | ec07 | a060 |
| 3642320 | ee07 | a05c | ec23 | a060 | ee23 | a05c | f627 | a050 | d206 | c000 | f606 | e004 | 9603 | a068 | d222 | e000 | f622 | e004 | 9210 | 0019 | 9410 | 001a | 9010 | 0018 |
| 3642400 | 9810 | 001c | 4000 | 0017 | 9a10 | 001d | b610 | 0008 | 8090 | 001b | 1280 | 0011 | 0100 | 0000 | d807 | a050 | ec23 | a060 | ee23 | a05c | da03 | 0000 | d803 | 2004 |
| 3642460 | 9603 | a068 | da22 | e000 | d822 | e004 | 9810 | 001c | 9a10 | 001d | 9010 | 0018 | 9410 | 001a | 4000 | 01b9 | 9210 | 0019 | b610 | 0008 | 81c7 | e008 | 91e8 | 001b |
| 3642540 | 9de3 | bf68 | f627 | a050 | d807 | a050 | 9010 | 2002 | d027 | bfec | f027 | bff0 | f227 | bff4 | c027 | bfdc | c027 | bfe0 | c027 | bfe4 | c027 | bfe8 | c206 | a060 |
| 3642620 | 9603 | a060 | c200 | 6004 | 1500 | 05cf | c200 | 4000 | da03 | 0000 | d803 | 2004 | da22 | e000 | d822 | e004 | d623 | a05c | d006 | a060 | 1900 | 05cf | 9813 | 23b0 |
| 3642700 | 9607 | bfec | 9a07 | bfd4 | 9412 | a340 | 9fc0 | 4000 | 9210 | 2004 | 8090 | 0008 | 0280 | 0004 | b610 | 2000 | 1080 | 0044 | b610 | 2002 | d007 | bfd8 | 80a2 | 2001 |
| 3642760 | 2280 | 0006 | ee07 | a05c | 4000 | 0f40 | 0100 | 0000 | b610 | 0008 | ee07 | a05c | 8090 | 001b | 3280 | 0012 | 8090 | 001b | d007 | bfe0 | 7ffa | 8edd | 9002 | 2002 |
| 3643040 | 8090 | 0008 | 0280 | 000a | d027 | 0000 | d007 | bfe8 | 7ffa | 8ed7 | 9002 | 2002 | 8090 | 0008 | 1280 | 0005 | d025 | c000 | 7ffa | 8fa9 | d007 | 0000 | b610 | 2007 |
| 3643120 | 8090 | 001b | 3280 | 0020 | c206 | a060 | e407 | bfe0 | aa10 | 200a | e427 | 4000 | d007 | bfdc | d407 | bfe0 | 4000 | 04d2 | d207 | 0000 | e807 | bfe0 | e607 | 0000 |
| 3643200 | ea2c | c014 | d007 | bfe0 | f807 | 0000 | b807 | 0008 | c02f | 2001 | d407 | a060 | d607 | bfe8 | d622 | 8000 | d007 | bfe4 | d205 | c000 | 4000 | 04c4 | d407 | bfe8 |
| 3643260 | d805 | c000 | da07 | bfe8 | 9e10 | 200a | de2b | 000d | ee05 | c000 | e207 | bfe8 | ae05 | c011 | c02d | e001 | c206 | a060 | 1300 | 05cf | c200 | 6004 | 9212 | 63b0 |
| 3643340 | c200 | 600c | d006 | a060 | 9fc0 | 4000 | 9407 | bfd4 | 91c7 | e008 | 91e8 | 001b | 9de3 | bf80 | 8090 | 0019 | 0280 | 0006 | 8090 | 0018 | 0280 | 0004 | 8090 | 001a |
| 3643420 | 1280 | 0004 | 0100 | 0000 | 1080 | 0047 | b010 | 2001 | 7fff | 7b18 | 9010 | 0018 | ae10 | 0008 | 7fff | 7b15 | 9010 | 0019 | 8090 | 0017 | 0280 | 0008 | 80a5 | e040 |

```
3643500  1880 0006 8090 0008 0280 0004 80a2 2040 2880 0004 ec07 a05c 1080 0037 b010 2001 ea07 a060 9010 0018 7fff fac6 9207 bffc
3643560  ae10 0008 8090 0017 3280 002f b010 0017 d407 bffc d402 a068 80a2 a002 3280 0005 1f00 05cc 1b00 05cc 1080 0003 ae03 60cc
3643640  ae03 e26c 2100 05ca ea23 a068 ec23 a064 fa23 a060 f823 a05c a014 226c e204 0000 e004 2004 9a03 a070 e223 6000 e023 6004
3643720  d807 bffc 9010 0018 9410 001a 9610 001b 9210 0019 8210 0017 9fc0 4000 0100 0000 ae10 0008 80a5 e002 3280 000f b010 0017
3644000  7fff fb57 9010 0018 1100 05ca 4000 0725 1002 2250 9010 0018 7fff fa9a 9207 bffc ae10 0008 8090 0017 22bf ffd7 d407 bffc
3644060  b010 0017 81c7 e008 81e8 0000 9de3 bf70 fa27 a058 da07 a058 f027 bff0 f227 bff4 f427 bff8 f627 bffc c027 bfe8 c027 bfe0
3644140  c027 bfec c027 bfe4 c207 2060 9803 a060 c200 6004 1500 05cf c200 4000 de03 4000 da03 6004 de23 2000 da23 2004 d823 a05c
3644220  d007 2060 1900 05cf 9813 2190 9a07 bfdc 9412 a0b8 9607 bff0 9fc0 4000 9210 2005 8090 0008 0280 0004 ba10 2000 1080 0046
3644300  ba10 2002 d007 bfdc 80a2 2001 2280 0006 ec07 a064 4000 0e89 0100 0000 ba10 0008 ec07 a064 ee07 a05c 8090 001d 3280 0012
3644360  8090 001d d007 bfe4 7ffa 8e25 9002 2002 8090 0008 0280 000a d025 c000 d007 bfec 7ffa 8e1f 9002 2002 8090 0008 1280 0005
3644440  d025 8000 7ffa 8ef1 d005 c000 ba10 2007 8090 001d 3280 0021 c207 2060 e807 bfe4 e607 a060 a410 200a e824 c000 d007 bfe0
3644520  d407 bfe4 4000 0419 d205 c000 d007 bfe4 ea05 c000 9210 200a d22d 4008 d607 bfe4 ee05 c000 ae05 c00b c02d e001 da07 a068
3644600  de07 bfec de23 4000 d007 bfe8 d205 8000 4000 040a d407 bfec e005 8000 e207 bfec e42c 0011 ec05 8000 e807 bfec ac05 8014
3644660  c02d a001 c207 2060 1300 05cf c200 6004 9212 6190 c200 600c d007 2060 9fc0 4000 9407 bfdc 81c7 e008 91e8 001d 9de3 bf88
3644740  ea07 a068 ec07 a064 ee07 a060 fa27 a058 fa07 a05c d007 a058 fa23 a05c ee23 a060 ec23 a064 ea23 a068 d202 0000 d002 2004
3645020  9a03 a070 d223 6000 d023 6004 9010 0018 9210 0019 9610 001b 9410 001a 4000 0017 9810 001c b410 0008 8090 001a 1280 0011
3645100  0100 0000 d807 a058 ea23 a060 ec23 a05c da03 0000 d803 2004 9603 a070 da22 e000 d822 e004 9810 001d 9a10 0017 9010 0018
3645160  9410 001c 4000 006f 9210 0019 b410 0008 81c7 e008 91e8 001a 9de3 bf68 fa27 a058 d807 a058 9010 2001 d027 bfec f027 bff0
3645240  f227 bff4 f427 bff8 f627 bffc c027 bfdc c027 bfe0 c027 bfe4 c027 bfe8 c207 2060 9603 a060 c200 6004 1500 05cf c200 4000
3645320  da03 0000 d803 2004 da22 e000 d822 e004 d623 a05c d007 2060 1900 05cf 9813 23b0 9607 bfec 9a07 bfd4 9412 a340 9fc0 4000
3645400  9210 2005 8090 0008 0280 0004 ba10 2000 1080 0046 ba10 2002 d007 bfd8 80a2 2001 2280 0006 ec07 a064 4000 0df4 0100 0000
3645460  ba10 0008 ec07 a064 ee07 a05c 8090 001d 3280 0012 8090 001d d007 bfe0 7ffa 8d90 9002 2002 8090 0008 0280 000a d025 c000
3645540  d007 bfe8 7ffa 8d8a 9002 2002 8090 0008 1280 0005 d025 8000 7ffa 8e5c d005 c000 ba10 2007 8090 001d 3280 0021 c207 2060
3645620  e607 bfe0 e407 a060 a210 200a e624 8000 d007 bfdc d407 bfe0 4000 0384 d205 c000 ea07 bfe0 e805 c000 9010 200a d02d 0015
3645700  d407 bfe0 ee05 c000 ae05 c00a c02d e001 d807 a068 da07 bfe8 da23 0000 d007 bfe4 d205 8000 4000 0375 d407 bfe8 de05 8000
3645760  e007 bfe8 e22b c010 ec05 8000 e607 bfe8 ac05 8013 c02d a001 c207 2060 1300 05cf c200 6004 9212 63b0 c200 600c d007 2060
3646040  9fc0 4000 9407 bfd4 81c7 e008 91e8 001d 9de3 bf98 ec07 a05c ea07 a060 f627 a050 b610 2000 8090 001b 1100 05cd 1280 0028
3646120  a802 2188 d007 0000 1500 05cd d402 a18c 4000 02de 9210 0014 8090 0008 1280 0020 0100 0000 ee07 0000 f607 4000 c027 0000
3646200  c027 4000 7ffa 8e19 d005 8000 c025 8000 c025 4000 d207 a050 f823 a05c fa23 a060 ec23 a064 ea23 a068 d402 4000 d202 6004
3646260  9a03 a070 d423 6000 d223 6004 9210 0019 9410 0017 9010 0018 9610 001b 7fff ff6f 9810 001a b610 0008 7ffa 8e04 9010 0017
3646340  8090 001b 22bf ffdd d007 0000 81c7 e008 91e8 001b 0000 0000 5950 5f00 0000 0003 8090 0008 3280 0006 d402 4000 d602 4000
3646420  1900 05de 1080 0003 d623 2080 d422 0000 81c3 e008 c022 4000 9de3 bfa0 d006 2018 8090 0008 2280 0005 d206 2010 7ffa 8deb
3646500  d006 2018 d206 2010 8090 0009 2280 0005 d406 200c 7ffa 8de5 d006 2010 d406 200c 8090 000a 2280 0005 d606 2008 7ffa 8ddf
3646560  d006 200c d606 2008 8090 000b 2280 0005 9210 2020 7ffa 8dd9 d006 2008 9210 2020 7ffa 8ef4 9010 0018 7ffa 8dd4 9010 0018
3646640  81c7 e008 81e8 0000 9de3 bfa0 7ffa 8cf8 9010 2020 ba10 0008 8090 001d 2280 0020 ba10 2000 9210 2020 7ffa 8ee6 9010 001d
3646720  7fff 796c 9010 0018 7ffa 8ced 9002 2001 8090 0008 0280 0013 d027 6008 7fff 7965 9010 0019 7ffa 8ce6 9002 2001 8090 0008
3647000  0280 000c d027 600c 7ffa 8ce1 9010 001a 8090 0008 0280 0007 d027 6010 7ffa 8cdc 9010 001b 8090 0008 1280 0005 d027 6018
3647060  7fff ffbe 9010 001d ba10 2000 81c7 e008 91e8 001d 9de3 bf78 8090 0019 0280 0004 8090 0018 1280 0004 0100 0000 1080 00bc
3647140  ae10 2001 7fff 7947 9010 0018 ae10 0008 7fff 7944 9010 0019 8090 0017 0280 000c 80a5 e040 1880 000a 8090 0008 0280 0008
3647220  80a2 2040 1880 0006 8090 001a 0280 0004 8090 001b 3280 0004 1500 05de 1080 00a8 ae10 2001 ee02 a080 aa10 2000 8090 0017
3647300  0280 004f ac10 2000 d605 e014 80a2 c01b 3280 003d 80a5 a010 d205 e010 9410 001b 4000 023e 9010 001a 8090 0008 3280 0036
3647360  80a5 a010 d205 e00c 7fff e438 9010 0019 8090 0008 3280 0030 80a5 a010 d205 e008 7fff e432 9010 0018 8090 0008 3280 002a
3647440  80a5 a010 9207 bff0 7fff 9992 9007 bff8 da07 bff8 de05 e004 9a23 400f 80a3 6258 2880 0009 f005 e01c 9210 0017 7fff ff6d
3647520  9010 0015 7fff ff75 9010 0017 1080 0029 9010 0018 b006 2002 7ffa 8c89 9010 0018 d027 0000 e607 0000 8090 0013 3280 0004
3647600  d005 e018 1080 0072 ae10 2007 d207 0000 4000 028a 9410 0018 e805 e01c 9010 0015 e827 4000 7fff ff57 9210 0017 1300 05de
3647660  d002 6080 d025 c000 ee22 6080 1080 0064 ae10 2000 2680 0009 aa10 0017 9210 0017 7fff ff4c 9010 0015 7fff ff54 9010 0017
3647740  1080 0008 9010 0018 ee05 c000 ac05 a001 8090 0017 32bf ffb6 d605 e014 9010 0018 7fff f8a0 9207 bfec ae10 0008 8090 0017
3650020  1280 004f 0100 0000 d407 bfec d402 a068 80a2 a002 3280 0005 1f00 05ce 1b00 05ce 1080 0003 ae03 61e4 ae03 e31c 2100 05ca
3650100  fa23 a060 f823 a05c a014 226c e204 0000 e004 2004 9a03 a068 e223 6000 e023 6004 d807 bfec 9010 0018 9410 001a 9610 001b
3650160  9210 0019 8210 0017 9fc0 4000 0100 0000 ac10 0008 80a5 a002 3280 0009 8090 0016 7fff f933 9010 0018 1100 05ca 4000 0501
3650240  d002 2250 10bf ffd7 9010 0018 3280 0028 ae10 0016 ea07 4000 9410 001b aa05 6002 9610 0015 9210 0019 7fff ff38 9010 0018
3650320  ae10 0008 8090 0017 2280 001d ae10 0016 9207 bff0 7fff 9923 9007 bff8 1300 05de d002 6080 d025 c000 ee22 6080 d607 bff8
3650400  9210 0018 d625 e004 7fff 992e d005 e008 d005 e00c 7fff 992b 9210 0019 f625 e014 d205 e010 9010 001a 4000 0224 9410 001b
3650460  d007 0000 d205 e018 4000 0220 9410 0015 fa07 4000 fa25 e01c ae10 0016 81c7 e008 91e8 0017 9de3 bf78 fa27 a058 d607 a058
3650540  f027 bff0 f227 bff4 f427 bff8 f627 bffc c027 bfe8 c027 bfec c207 2060 9403 a060 c200 6004 9a07 bfe4 c200 4000 d802 c000
```

```
3650620  d602 e004 d822 a000 d622 a004 d423 a05c d007 2060 1500 05cf 1900 05cf 9813 2150 9412 a0b8 9607 bff0 9fc0 4000 9210 2003
3650700  8090 0008 0280 0004 ba10 2000 1080 002e ba10 2002 d007 bfe4 80a2 2001 2280 0006 ee07 a05c 4000 0c45 0100 0000 ba10 0008
3650760  ee07 a05c 8090 001d 3280 000a 8090 001d d007 bfec 7ffa 8be2 9002 2002 8090 0008 1280 0003 d025 c000 ba10 2007 8090 001d
3651040  3280 0012 c207 2060 e407 bfec e207 a060 aa10 200a e424 4000 d007 bfe8 d205 c000 4000 01de d407 bfec e605 c000 e807 bfec
3651120  ea2c c014 ee05 c000 d007 bfec ae05 c008 c02d e001 c207 2060 1300 05cf c200 6004 9212 6150 c200 600c d007 2060 9fc0 4000
3651200  9407 bfe4 81c7 e008 91e8 001d 9de3 bf68 fa27 a058 d807 a058 9010 2001 d027 bfec f027 bff0 f227 bff4 f427 bff8 f627 bffc
3651260  c027 bfdc c027 bfe0 c207 2060 9603 a060 c200 6004 1500 05cf c200 4000 da03 0000 d803 2004 da22 e000 d822 e004 d623 a05c
3651340  d007 2060 1900 05cf 9813 23b0 9607 bfec 9a07 bfd4 9412 a340 9fc0 4000 9210 2003 8090 0008 0280 0004 ba10 2000 1080 002e
3651420  ba10 2002 d007 bfd8 80a2 2001 2280 0006 ee07 a05c 4000 0bf5 0100 0000 ba10 0008 ee07 a05c 8090 001d 3280 000a 8090 001d
3651500  d007 bfe0 7ffa 8b92 9002 2002 8090 0008 1280 0003 d025 c000 ba10 2007 8090 001d 3280 0012 c207 2060 e607 bfe0 e407 a060
3651560  ac10 200a e624 0000 d007 bfdc d205 c000 4000 018e d407 bfe0 e805 c000 ea07 bfe0 ec2d 0015 ee05 c000 d207 bfe0 ae05 c009
3651640  c02d e001 c207 2060 1300 05cf c200 6004 9212 63b0 c200 600c d007 2060 9fc0 4000 9407 bfd4 81c7 e008 91e8 001d 0000 0000
3651720  9de3 bfa0 9406 6004 9210 0019 9010 0018 4000 09c7 9610 2400 81c7 e008 91e8 0008 9de3 bfa0 9010 0018 9210 0019 4000 0a28
3652000  9410 2040 81c7 e008 91e8 0008 9de3 bfa0 9010 0018 9210 0019 4000 0a21 9410 2040 81c7 e008 91e8 0008 9de3 bfa0 9010 0018
3652060  7fff fff0 9210 0019 8090 0008 2280 000f b010 2000 9010 0018 7fff fff1 9206 6004 8090 0008 2280 0009 b010 2000 9010 0018
3652140  7fff ffdc 9206 6008 8090 0008 2280 0003 b010 2000 b010 2001 81c7 e008 81e8 0000 9de3 bfa0 9010 0018 7fff ffda 9210 0019
3652220  8090 0008 2280 0009 b010 2000 9010 0018 7fff ffdb 9206 6004 8090 0008 2280 0003 b010 2000 b010 2001 81c7 e008 81e8 0000
3652300  9de3 bfa0 9010 0018 4000 0898 9210 0019 8090 0008 2280 0009 b010 2000 9010 0018 7fff ffbc 9206 6004 8090 0008 2280 0003
3652360  b010 2000 b010 2001 81c7 e008 81e8 0000 9de3 bfa0 9010 0018 4000 0888 9210 0019 8090 0008 2280 000f b010 2000 9010 0018
3652440  7fff ffac 9206 600c 8090 0008 2280 0009 b010 2000 9010 0018 7fff ffa6 9206 6004 8090 0008 2280 0003 b010 2000 b010 2001
3652520  81c7 e008 81e8 0000 9de3 bfa0 9010 0018 9210 0019 4000 0921 9410 2004 81c7 e008 91e8 0008 9de3 bfa0 9010 0018 7fff fff7
3652600  9210 0019 8090 0008 2280 000a b010 2000 9410 2002 9010 0018 4000 0914 9206 6004 8090 0008 2280 0003 b010 2000 b010 2001
3652660  81c7 e008 81e8 0000 9de3 bfa0 9010 0018 4000 0904 9210 0019 8090 0008 3280 0004 d006 4000 1080 0011 b210 2000 80a2 2001
3652740  0280 0006 80a2 2002 2280 0009 9010 0018 1080 000a b210 2000 9010 0018 7fff ffde 9206 6004 1080 0005 b210 0008 4000 0847
3653020  9206 6004 b210 0008 81c7 e008 91e8 0019 9de3 bfa0 9010 0018 9210 0019 4000 099c 9410 2100 81c7 e008 91e8 0008 9de3 bfa0
3653100  9010 0018 7fff ff6b 9210 0019 8090 0008 2280 0015 b010 2000 9010 0018 7fff ff6c 9206 6004 8090 0008 2280 000f b010 2000
3653160  9010 0018 4000 082d 9206 6008 8090 0008 2280 0009 b010 2000 9010 0018 7fff ffe5 9206 600c 8090 0008 2280 0003 b010 2000
3653240  b010 2001 81c7 e008 81e8 0000 0000 0000 9de3 bf80 1900 05cf 9813 20b8 9010 2001 9210 2002 9410 2001 9610 3fff 1b00 05cf
3653320  1f00 05cf d627 bffd d427 bff0 d227 bfe8 d027 bfe0 d827 bfe4 9e13 e2cc 9a13 6110 da27 bfec 9810 2000 9010 0018 9210 0019
3653400  9406 6004 9607 bfe0 c027 bffc de27 bff4 4000 0940 0100 0000 81c7 e008 91e8 0008 9de3 bf80 1900 05cf 9813 2150 9010 2001
3653460  9210 2002 9410 2003 9610 3fff 1b00 05cf 1f00 05cf d627 bff8 d427 bff0 d227 bfe8 d027 bfe0 d827 bfe4 9e13 e2cc 9a13 6190
3653540  da27 bfec 9810 2000 9010 0018 9210 0019 9406 6004 9607 bfe0 c027 bffc de27 bff4 4000 0924 0100 0000 81c7 e008 91e8 0008
3653620  9de3 bf98 f227 bffc 9207 bffc 7fff ff15 9010 0018 8090 0008 2280 0009 b010 2000 9010 0018 7fff ff70 9206 6044 8090 0008
3653700  2280 0003 b010 2000 b010 2001 81c7 e008 81e8 0000 0000 0000 80a2 a007 2480 0022 9222 4008 968a 2003 2280 002d 988a 6003
3653760  80a2 e002 0280 000c 80a2 e003 190a 0000 9002 2001 da0a 4000 9202 6001 9422 a001 0280 0012 80a3 000d 0280 0003 0100 0000
3654040  3080 001d d812 0000 9002 2002 da0a 4000 9202 6001 9733 2008 80a2 c00d 2280 0003 da0a 4000 3080 0014 9202 6001 9422 a002
3654120  980b 20ff 80a3 000d 0280 0011 988a 6003 3090 000d 1080 0008 94a2 a001 da0a 0009 9002 2001 80a3 000d 2280 0003 94a2 a001
3654200  3080 0005 36bf fffa d80a 0000 81c3 e008 9010 0000 81c3 e008 9010 2001 962a a003 940a a003 0280 0039 80a3 2002 0280 0026
3654260  80a3 2001 c20a 4000 9202 6001 0280 0010 9b28 6018 9222 4008 c202 0009 d802 0000 9002 2004 8530 6008 9a10 800d 80a3 000d
3654340  12bf ffed 96a2 e004 12bf fff8 9b28 6018 9222 6001 10bf ffe4 94a2 a001 c212 4000 9202 6002 8528 6008 9a13 4002 9222 4008
3654420  c202 0009 d802 0000 9002 2004 8530 6018 9a10 800d 80a3 000d 12bf ffdb 96a2 e004 12bf fff8 9b28 6008 9222 6003 10bf ffd2
3654500  94a2 a001 c212 4000 9202 6002 9b28 6010 9222 4008 c202 0009 d802 0000 9002 2004 8530 6010 9a10 800d 80a3 000d 12bf ffca
3654560  96a2 e004 12bf fff8 9b28 6010 9222 6002 10bf ffc1 94a2 a001 9222 4008 da02 0009 d802 0000 9002 2004 80a3 000d 12bf ffbe
3654640  96a2 e004 32bf fffb da02 0009 10bf ff56 94a2 a001 0900 0000 80a2 0009 1480 0008 80a2 a009 98a2 0009 2c80 0002 9820 000c
3654720  80a2 900c 1480 0066 80a2 a009 0480 005b 9a8a 2003 0280 0013 80a3 6002 0280 000a 80a3 6003 d60a 0000 9002 2001 d62a 4000
3655000  9202 6001 1280 0004 9422 a001 1080 000a 9a8a 6003 d612 0000 9002 2002 9932 e008 d82a 4000 d62a 6001 9202 6002 9422 a002
3655060  9a8a 6003 0280 003c 80a3 6002 0280 0027 80a3 6003 d802 0000 9002 2004 9b33 2018 da2a 4000 1280 0010 9202 6001 9422 a001
3655140  962a a003 9022 0009 832b 2008 d802 0009 96a2 e004 9b33 2018 8213 4001 c222 4000 12bf fffa 9202 6004 9022 2003 1080 0033
3655220  940a a003 9b33 2008 da32 4000 9202 6002 9422 a003 962a a003 9022 0009 832b 2018 d802 0009 96a2 e004 9b33 2008 8213 4001
3655300  c222 4000 12bf fffa 9202 6004 9022 2001 1080 0022 940a a003 d802 0000 9002 2004 9b33 2010 da32 4000 9202 6002 9422 a002
3655360  962a a003 9022 0009 832b 2010 d802 0009 96a2 e004 9b33 2010 8213 4001 c222 4000 12bf fffa 9202 6004 9022 2002 1080 000f
3655440  940a a003 962a a003 9022 0009 d802 0009 96a2 e004 d822 4000 14bf fffd 9202 6004 1080 0006 940a a003 1080 0004 9022 0009
3655520  d82a 4000 9202 6001 94a2 a001 36bf fffd 380a 0009 81c3 e008 9010 2000 9002 000a 9202 400a 9022 0009 9222 6001 d60a 0009
3655600  94a2 a001 14bf fffd d62a 4000 81c3 e008 9010 2000 0000 0000 932a 6018 933a 6018 d44a 0000 80a2 8009 0280 0007 0100 0000
3655660  da4a 0000 8090 000d 12bf fffa 9002 2001 9010 2000 81c3 e008 0100 0000 0000 0000 96a2 e001 2c80 0008 9010 2000 da4a 4000
```

| | | | | | | | | | | | | | | | | | | | | | | | | |
|---|---|---|---|---|---|---|---|---|---|---|---|---|---|---|---|---|---|---|---|---|---|---|---|---|
| 3655740 | da2a | 0000 | 80a3 | 400a | 9202 | 6001 | 12bf | fff9 | 9002 | 2001 | 81c3 | e008 | 0100 | 0000 | 0000 | 0000 | 9a10 | 0009 | d84b | 4000 | 8090 | 000c | 2280 | 000d |
| 3656020 | da4b | 4000 | d44b | 4000 | d64a | 0000 | 80a2 | 800b | 2280 | 0008 | d34b | 4000 | 9a03 | 6001 | d84b | 4000 | 8090 | 000c | 32bf | fff9 | d44b | 4000 | da4b | 4000 |
| 3656100 | 8090 | 000d | 2280 | 0004 | da4a | 0000 | 1080 | 0006 | 9a10 | 0008 | 8090 | 000d | 12bf | ffea | 9002 | 2001 | 9a10 | 2000 | 81c3 | e008 | 9000 | 000d | 0000 | 0000 |
| 3656160 | 9de3 | bfa0 | 9010 | 2001 | 7ffa | 8b60 | 9210 | 2028 | 1500 | 05de | d022 | a088 | d402 | a088 | 9090 | 000a | 3280 | 0004 | 1100 | 05de | 1080 | 0012 | ba10 | 2000 |
| 3656240 | d602 | 2088 | 9810 | 3fff | d822 | c000 | da02 | 2088 | 2100 | 05dc | c023 | 6004 | de02 | 2088 | a014 | 2368 | e023 | e008 | e202 | 2088 | a410 | 20ff | e424 | 600c |
| 3656320 | d002 | 2388 | a810 | 2008 | e822 | 2024 | ba10 | 2001 | 81c7 | e008 | 91e8 | 001d | 9de3 | bfa0 | f427 | a04c | f627 | a050 | f827 | a054 | fa27 | a058 | 9407 | a04c |
| 3656400 | 9010 | 0013 | 4000 | 0004 | 9210 | 0019 | 81c7 | e008 | 91e8 | 2000 | 9de3 | b768 | f027 | a044 | f227 | a048 | f427 | a04c | 1100 | 0295 | d002 | 21c8 | d027 | bffc |
| 3656460 | 1300 | 05de | d202 | 6088 | 8090 | 0009 | 1280 | 0007 | 0100 | 0000 | 7fff | ffcb | 0100 | 0000 | 8090 | 0008 | 0290 | 016e | 0100 | 0000 | d407 | a044 | 8090 | 000a |
| 3656540 | 0480 | 016a | 0100 | c000 | d607 | a044 | 980a | e3f8 | 9b3b | 2003 | 80a3 | 6018 | 1680 | 0164 | 0100 | 0000 | 1f00 | 05de | de03 | e088 | e003 | e00c | e207 | a044 |
| 3656620 | a40c | 6007 | a610 | 2001 | a92c | c012 | 808d | 0010 | 0280 | 015a | 0100 | 0000 | 2b00 | 05de | ea05 | 6088 | ec05 | 4000 | 8090 | 0016 | 1680 | 000c | 0100 | 0000 |
| 3656700 | 2f00 | 05de | ee05 | e088 | d005 | e008 | 3100 | 05de | f006 | 2388 | d206 | 2004 | 9212 | 6008 | 9410 | 2000 | 4000 | 014d | 0100 | 0000 | f207 | a044 | 808e | 63f8 |
| 3656760 | 1280 | 0008 | 0100 | 0000 | 3500 | 05de | f406 | a088 | f606 | a024 | f807 | a044 | b817 | 001b | f827 | a044 | ba07 | bbf7 | fa27 | bff8 | d007 | bff8 | 1300 | 05dc |
| 3657040 | 9212 | 636f | d407 | a044 | 7fff | 6d50 | 0100 | 0000 | d007 | bff8 | 7fff | 7553 | 0100 | 0000 | d207 | bff8 | 9202 | 4008 | d227 | bff8 | 9007 | bbf0 | 7fff | 95af |
| 3657120 | 0100 | 0000 | 9007 | bbf0 | 4000 | 0968 | 0100 | 0000 | d402 | 2004 | d007 | bff8 | 1300 | 05dc | 9212 | 6374 | 7fff | 6d3e | 0100 | 0000 | d007 | bff8 | 7fff | 7541 |
| 3657200 | 0100 | 0000 | d407 | bff8 | 9402 | 9008 | d427 | bff8 | 1700 | 05de | d602 | e088 | d802 | e008 | 8090 | 000c | 0280 | 000e | 0100 | 0000 | 1b00 | 05de | da03 | 6088 |
| 3657260 | d203 | 6008 | d007 | bff8 | 7fff | 95c2 | 0100 | 0000 | d007 | bff8 | 7fff | 752f | 0100 | 0000 | de07 | bff8 | 9e03 | c008 | de27 | bff8 | 2100 | 05de | e004 | 2088 |
| 3657340 | e204 | 2004 | 808c | 6001 | 0280 | 0010 | 0100 | 0000 | 7fff | f4b0 | 0100 | 0000 | 9410 | 0008 | d007 | bff8 | 1300 | 05dc | 9212 | 637b | 7fff | 6d18 | 0100 | 0000 |
| 3657420 | d007 | bff8 | 7fff | 751b | 0100 | 0000 | e407 | bff8 | a404 | 8008 | e427 | bff8 | 2700 | 05de | e604 | e088 | e804 | e008 | 8090 | 0014 | 0280 | 000a | 0100 | 0000 |
| 3657500 | d007 | bff8 | 1300 | 05dc | 9212 | 6380 | 7fff | 959d | 0100 | 0000 | ea07 | bff8 | aa05 | 6002 | ea27 | bff8 | ac07 | b7eb | ec27 | bbec | ee07 | a048 | ee27 | b7e4 |
| 3657560 | f007 | b7e4 | f24e | 0000 | b410 | 0019 | f427 | b7dc | f607 | b7dc | f627 | b7e0 | f807 | b7e4 | b807 | 2001 | f827 | b7e4 | fa07 | b7e0 | 8090 | 001d | 0280 | 005d |
| 3657640 | 0100 | 0000 | d007 | b7dc | 80a2 | 200a | 0280 | 0059 | 0100 | 0000 | 9207 | bbeb | d407 | bbec | 80a2 | 8009 | 1a30 | 0054 | 0100 | 0000 | d607 | b7dc | 80a2 | e025 |
| 3657720 | 0280 | 000a | 0100 | 0000 | d807 | bbec | da07 | b7dc | da2b | c000 | de07 | bbec | 9e03 | e001 | de27 | bbec | 1080 | 003b | 0100 | 0000 | e007 | b7e4 | e24c | 0000 |
| 3660000 | a410 | 0011 | e427 | b7dc | e607 | b7dc | e627 | b7d8 | e807 | b7e4 | a805 | 2001 | e827 | b7e4 | ea07 | b7d8 | 80a5 | 606d | 0280 | 0010 | 0100 | 0000 | ec07 | bbec |
| 3660060 | ae10 | 2025 | ee2d | 8000 | f007 | bbec | b006 | 2001 | f027 | bbec | f207 | bbec | f407 | b7dc | f42e | 4000 | f607 | bbec | b606 | e001 | f627 | bbec | 1080 | 0020 |
| 3660140 | 0100 | 0000 | 3900 | 0292 | f807 | 23a0 | ba10 | 001c | d007 | bffc | 9210 | 0008 | 80a2 | 401d | 0880 | 000a | 0100 | 0000 | d007 | bbec | 1300 | 05dc | 9212 | 6383 |
| 3660220 | d407 | bffc | 7fff | 6cb5 | 0100 | 0000 | 1080 | 000a | 0100 | 0000 | d407 | bffc | 972a | a002 | 1900 | 0292 | 9813 | 2239 | d202 | c00c | d007 | bbec | 7fff | 9541 |
| 3660300 | 0100 | 0000 | d007 | bbec | 7fff | 74ae | 0100 | 0000 | da07 | bbec | 9a03 | 4008 | da27 | bbec | f007 | b7e4 | f24e | 0000 | b410 | 0019 | f427 | b7dc | f607 | b7dc |
| 3660360 | f627 | b7e0 | f807 | b7e4 | b807 | 2001 | f827 | b7e4 | fa07 | b7e0 | 8090 | 001d | 12bf | ffa7 | 0100 | 0000 | de07 | bbec | a010 | 200a | e02b | c000 | e207 | bbec |
| 3660440 | a204 | 6001 | e227 | bbec | e407 | bbec | c02c | 8000 | 9207 | b7eb | d007 | bff8 | d407 | a04c | 4000 | 07c9 | 0100 | 0000 | 9007 | bbf7 | 7fff | 748e | 0100 | 0000 |
| 3660520 | d027 | b7dc | e607 | b7dc | 80a4 | e400 | 0480 | 0004 | 0100 | 0000 | a810 | 2400 | e827 | b7dc | 9207 | bbf7 | 1900 | 05de | d803 | 2088 | 9803 | 2010 | 2b00 | 05de |
| 3660600 | ea05 | 6088 | d005 | 4000 | d407 | b7dc | 9610 | 2000 | 9a10 | 2010 | 4000 | 081d | 0100 | 0000 | 8090 | 0008 | 1680 | 005a | 0100 | 0000 | 2d00 | 05de | ec05 | a088 |
| 3660660 | ee05 | a004 | 808d | e002 | 0280 | 0054 | 0100 | 0000 | 7fff | 6ca8 | 0100 | 0000 | d027 | b7d4 | f007 | b7d4 | 80a6 | 3fff | 0280 | 004d | 0100 | 0000 | f207 | b7d4 |
| 3660740 | 8090 | 0019 | 1280 | 0035 | 0100 | 0000 | 9010 | 200e | 9210 | 2000 | 7ffa | 6bc6 | 0100 | 0000 | 9010 | 2000 | 4000 | 0816 | 0100 | 0000 | 353f | fff7 | b416 | a3ff |
| 3661020 | 900a | 001a | 4000 | 0925 | 0100 | 0000 | 9010 | 2005 | 4000 | 085e | 0100 | 0000 | 1100 | 05dc | 9012 | 2354 | 9210 | 2001 | 7ffd | 74c5 | 0100 | 0000 | d027 | b7d0 |
| 3661100 | 9010 | 2000 | 4000 | 0855 | 0100 | 0000 | d007 | bff8 | 1300 | 05dc | 9212 | 638c | 7fff | 949e | 0100 | 0000 | 9007 | bbf7 | 9210 | 203e | 7fff | fe4c | 0100 | 0000 |
| 3661160 | b502 | 2001 | f627 | bff8 | b807 | bbf7 | fa07 | bff8 | 9027 | 401c | d407 | b7dc | 9402 | a001 | 9422 | 8008 | d207 | bff8 | d007 | b7d0 | 7ffd | f674 | 0100 | 0000 |
| 3661240 | d007 | b7d0 | 7ffd | 7495 | 0100 | 0000 | 9010 | 2000 | 7fff | 6c78 | 0100 | 0000 | 1300 | 05de | d202 | 6088 | d402 | 6004 | 808a | a010 | 1280 | 000f | 0100 | 0000 |
| 3661320 | 9010 | 2000 | 7fff | 6c47 | 0100 | 0000 | d027 | b7dc | d607 | b7dc | 8090 | 000b | 0480 | 0007 | 0100 | 0000 | d807 | b7dc | da07 | b7d4 | 80a3 | 000d | 12bf | fff5 |
| 3661400 | 0100 | 0000 | c027 | b7cc | d007 | b7cc | 81c7 | e008 | 91e8 | 0008 | 9de3 | bfa0 | 1100 | 05de | d002 | 2088 | 8090 | 0008 | 3280 | 0008 | 8090 | 0018 | 7fff | fe51 |
| 3661460 | 0100 | 0000 | 8090 | 0008 | 0280 | 0032 | 0100 | 0000 | 8090 | 0018 | 2290 | 0006 | 1500 | 05de | 1300 | 05de | d202 | 6088 | f022 | 6008 | 1590 | 05de | d402 | a088 |
| 3661540 | 8090 | 001a | 0280 | 0006 | f222 | a004 | 1700 | 05de | d602 | e088 | b40e | a3f8 | f422 | e024 | 1b00 | 05de | da03 | 6088 | da03 | 4000 | 8090 | 000d | 1680 | 001d |
| 3661620 | 2500 | 05de | e004 | a088 | a210 | 2001 | e234 | 2010 | d004 | a088 | 1300 | 05dc | 9212 | 6348 | 9002 | 2012 | 7fff | ed08 | 9410 | 200e | e404 | a088 | e404 | a004 |
| 3661700 | 808c | a008 | 2280 | 000f | b010 | 2000 | 9410 | 2000 | 9210 | 2002 | 4000 | 07bf | 9010 | 2001 | 1300 | 05de | e802 | 6088 | 9410 | 2001 | d025 | 0000 | d002 | 6088 |
| 3661760 | 9210 | 2002 | 4000 | 0753 | d002 | 0000 | b010 | 2000 | 81c7 | e008 | 81e8 | 0000 | 9de3 | bfa0 | 1100 | 05de | d002 | 2088 | 8090 | 0008 | 0280 | 0009 | 2100 | 05de |
| 3662040 | d004 | 2088 | ba10 | 2000 | 7ffd | 7434 | d002 | 0000 | e004 | 2088 | 9610 | 3fff | d624 | 0000 | 81c7 | e008 | 91e8 | 001d | 9de3 | bfc0 | 1100 | 05de | d002 | 2088 |
| 3662120 | 8090 | 0008 | 3280 | 0008 | 1300 | 05de | 7fff | fe05 | 0100 | 0000 | 8090 | 0008 | 0280 | 000b | 0100 | 0000 | 1300 | 05de | d202 | 6088 | 8090 | 0018 | 0280 | 0005 |
| 3662200 | fa02 | 600c | 1700 | 05de | d602 | e088 | f022 | e00c | b010 | 001d | 81c7 | e008 | 81e8 | 0000 | 0000 | 0000 | 9de3 | bf68 | 8090 | 0018 | 0280 | 0059 | ba07 | bff0 |
| 3662260 | c027 | 6004 | c027 | 4000 | c027 | 600c | c027 | 6008 | 9010 | 2000 | 9210 | 001d | 4000 | 075a | 9407 | bfe0 | 8090 | 0008 | 0680 | 004e | 0100 | 0000 | f027 | 6008 |
| 3662340 | d407 | bfe8 | 8090 | 000a | 3280 | 0007 | da07 | 6008 | d607 | bfec | 8090 | 000b | 2280 | 001c | 3700 | 05d3 | da07 | 6008 | 80a2 | 800d | 3480 | 000c | e807 | 6008 |
| 3662420 | e007 | 6008 | 80a2 | 8010 | 3280 | 000b | ac07 | bfe8 | e407 | 600c | e207 | bfec | 80a4 | 4012 | 2480 | 0006 | ac07 | bfe8 | e807 | 6008 | a822 | 8014 | 1080 | 000a |
| 3662500 | e827 | bfe8 | ee05 | 8000 | ec05 | a004 | aa07 | 6008 | ee25 | 6000 | ec25 | 6004 | b410 | 2001 | f427 | bfe8 | c027 | bfec | 3700 | 05d3 | b616 | e2a4 | f627 | bfd4 |
| 3662560 | c027 | bfd8 | c027 | bfdc | 9010 | 200e | 9407 | bfc8 | 7ffa | 6a88 | 9207 | bfd4 | 4000 | 0734 | 1100 | 0008 | b010 | 0008 | 2100 | 05de | c024 | 2090 | 9010 | 2000 |
| 3662640 | 9210 | 001d | 4000 | 0723 | 9410 | 2000 | e004 | 2090 | 133f | fff7 | 9212 | 63ff | 8090 | 0010 | 1280 | 0009 | ba0e | 0009 | 4000 | 072f | 9010 | 001d | 1700 | 05de |
| 3662720 | d602 | e090 | 8090 | 000b | 02bf | fffb | 0100 | 0000 | 9410 | 2000 | 9010 | 200e | 7ffa | 6a6e | 9207 | bfc8 | 4000 | 072e | 9010 | 0018 | 9010 | 2000 | 9207 | bfe0 |
| 3663000 | 4000 | 070c | 9410 | 2000 | ba10 | 2000 | 81c7 | e008 | 91e8 | 001d | 1300 | 05de | 9010 | 2001 | 81c3 | e008 | d022 | 6090 | 0000 | 0000 | 9de3 | bf60 | f627 | a050 |

| | | | | | | | | | | | | | | | | | | | | | | | | |
|---|---|---|---|---|---|---|---|---|---|---|---|---|---|---|---|---|---|---|---|---|---|---|---|---|
| 3663060 | 7ffa | 86d7 | 9010 | 200c | b610 | 0008 | 8090 | 001b | 3280 | 0010 | ec07 | a05c | 1300 | 05d6 | 1100 | 0294 | 9012 | 2370 | 7fff | f27b | 9212 | 6068 | 1700 | 05dd |
| 3663140 | 9612 | e000 | 9010 | 200c | d022 | e000 | 1500 | 0295 | 3402 | a1c8 | 9602 | e008 | 1080 | 008b | d422 | e000 | ae07 | 6003 | af35 | e002 | ac05 | a003 | ad35 | a002 |
| 3663220 | af2d | e002 | 9005 | e364 | ad2d | a002 | 7ffa | 86bc | 9002 | 0016 | ba10 | 0008 | 8090 | 001d | 3280 | 0010 | 9607 | 6060 | 1300 | 05d6 | 1100 | 0294 | 9012 | 2370 |
| 3663300 | 7fff | f260 | 9212 | 6387 | 1500 | 05dd | 9412 | a000 | a810 | 200c | e822 | a000 | 1300 | 0295 | d202 | 61c8 | 9402 | a008 | 1080 | 0070 | d222 | a000 | 9602 | c016 |
| 3663360 | d627 | 6058 | 9210 | 2000 | 7fff | 939e | 9007 | bff8 | 1e16 | 2002 | 8090 | 000f | 1280 | 000a | 9610 | 2011 | 9410 | 001a | 9210 | 0019 | 4000 | 024e | 9010 | 0018 |
| 3663440 | 8090 | 0008 | 2280 | 0061 | 8090 | 001d | d036 | 2002 | 4000 | 020e | a407 | 6008 | d026 | e004 | fa26 | e008 | e806 | 0000 | d006 | 2004 | e824 | a000 | e806 | 2008 |
| 3663520 | d024 | a004 | f006 | 200c | e824 | a008 | f024 | a00c | 9210 | 2010 | d227 | 6018 | d607 | a050 | 9407 | 601c | d802 | c000 | d602 | e004 | d822 | a000 | d622 | a004 |
| 3663600 | 9e10 | 3fff | de27 | 6024 | a010 | 3fff | e027 | 6028 | ee27 | 6054 | 7fff | f287 | ec27 | 605c | e207 | bff8 | e607 | bffc | 901a | 0011 | 901a | 0013 | d027 | bfc8 |
| 3663660 | 9210 | 2002 | d227 | bfd0 | c027 | bfcc | f227 | bfd4 | f427 | bfd8 | d207 | 6058 | b007 | 6038 | 9010 | 0018 | 9410 | 0017 | 4000 | 0595 | 9610 | 2000 | 9207 | bfc8 |
| 3663740 | 4000 | 0312 | 9010 | 0018 | 8090 | 0008 | 2280 | 002f | 8090 | c01d | c207 | 603c | 9010 | 0018 | c200 | 6010 | 9fc0 | 4000 | 0100 | 0000 | d027 | 6050 | d807 | 0000 |
| 3664020 | 8090 | 000c | 3680 | 001e | c027 | 6004 | 9a10 | 2001 | da27 | bfc4 | 9410 | 2011 | 9210 | 2002 | 4000 | 06a9 | 9010 | 2002 | d027 | 0000 | de07 | 0000 | 8090 | 000f |
| 3664100 | 3680 | 000a | d007 | 0000 | 1100 | 05dd | 9012 | 2000 | a010 | 200c | e022 | 2000 | 2500 | 0295 | e404 | a1c8 | 1080 | 0011 | e422 | 2008 | 4000 | 06ec | 9210 | 2000 |
| 3664160 | d007 | 0000 | 1320 | 0119 | 9212 | 627e | 7fff | 74f1 | 9407 | bfc4 | a810 | 2001 | e827 | 6004 | f807 | 0000 | 4000 | 0724 | f827 | 4000 | ba10 | 001b | 1080 | 000d |
| 3664240 | d026 | c000 | 8090 | 001d | 2280 | 0005 | 8090 | 001b | 7ffa | 870e | 9010 | 001d | 8090 | 001b | 2280 | 0005 | ba10 | 2000 | 7ffa | 8709 | 9010 | 001b | ba10 | 2000 |
| 3664320 | 81c7 | e008 | 91e8 | 001d | 9de3 | bf98 | 1b00 | 0008 | 9a13 | 6260 | da23 | a05c | f627 | a050 | d406 | c000 | f606 | e004 | 9603 | a060 | d422 | e000 | f622 | e004 |
| 3664400 | 9410 | 001a | 9210 | 0019 | 9010 | 0018 | 7fff | ff47 | 9810 | 001c | 81c7 | e008 | 91e8 | 0008 | 9de3 | bef0 | f027 | a044 | f227 | a048 | f427 | a04c | f627 | a050 |
| 3664460 | f406 | 2008 | 9410 | 2002 | d427 | bffc | d606 | a028 | 80a2 | ffff | 3280 | 0009 | 9406 | a024 | da07 | a05c | 9807 | bff4 | de03 | 4000 | da03 | 6004 | de23 | 2000 |
| 3664540 | 1080 | 0007 | da23 | 2004 | d602 | 8000 | d402 | a004 | 9207 | bff4 | d622 | 6000 | d422 | 6004 | 9e07 | a048 | 9006 | a02c | 1b00 | 03d0 | ac03 | 6240 | d027 | bf54 |
| 3664620 | de27 | bf50 | a006 | a008 | a207 | bfa4 | a407 | bfa4 | aa06 | a01c | b206 | a060 | a606 | a038 | b010 | 2000 | ae10 | 2000 | c024 | c000 | c204 | e004 | 9010 | 0013 |
| 3664700 | c200 | 6014 | 9fc0 | 4000 | d206 | a050 | f606 | a058 | 9010 | 0013 | d216 | c000 | 9202 | 6001 | 932a | 6010 | 9332 | 6010 | d236 | c000 | c204 | e004 | d207 | bf50 |
| 3664760 | c200 | 6004 | 9fc0 | 4000 | 0100 | 0000 | 8090 | 0008 | 2280 | 002a | 9210 | 2001 | d007 | a044 | 9210 | 0013 | c202 | 0000 | c200 | 6020 | c200 | 6004 | 9fc0 | 4000 |
| 3665040 | d002 | 0000 | 8090 | 0008 | 2280 | 0020 | 9210 | 2001 | d207 | a050 | c207 | a04c | 9fc0 | 4000 | 9010 | 0013 | 8090 | 0008 | 2280 | 0019 | 9210 | 2001 | c204 | e004 |
| 3665120 | 9010 | 0013 | c200 | 6010 | 9fc0 | 4000 | 0100 | 0000 | a810 | 0008 | d006 | 8000 | d206 | a058 | da06 | a018 | 9810 | 0010 | 9610 | 2000 | 4000 | 05e4 | 9410 | 0014 |
| 3665200 | 80a2 | 0014 | 2280 | 000c | de07 | bff4 | 1900 | 0295 | d803 | 21c8 | 9a10 | 2003 | d826 | a030 | b610 | 2003 | 1080 | 00d1 | da26 | a02c | b610 | 2001 | 1080 | 00ce |
| 3665260 | d226 | a02c | 8090 | 000f | 3280 | 000a | 1700 | 05dc | d007 | bff8 | 8090 | 0008 | 3280 | 0006 | 1700 | 05dc | 9210 | 2005 | b610 | 2005 | 1080 | 00c3 | d226 | a02c |
| 3665340 | 9612 | e3f0 | d802 | c000 | da02 | e004 | 9407 | bfd0 | d822 | a000 | d602 | e008 | da22 | a004 | d622 | a008 | fa27 | bfe0 | f827 | bfe4 | 9210 | 2020 | 7ffa | 8795 |
| 3665420 | 9010 | 0011 | de06 | 8000 | 8090 | 000f | 3680 | 0004 | d606 | 8000 | 9e03 | e01f | d606 | 8000 | 9f3b | e005 | b72b | e002 | 8090 | 000b | 9810 | 201f | 1680 | 0006 |
| 3665500 | b606 | c012 | 9620 | 000b | 960b | 000b | 1080 | 0003 | 9620 | 000b | 960a | c00c | d006 | c000 | 9a10 | 2001 | 9b2b | 400b | 9012 | 000d | d026 | c000 | 9a10 | 2020 |
| 3665560 | 9607 | bfa4 | 9407 | bf84 | 9aa3 | 6004 | d802 | c00d | 12bf | fffe | d822 | 800d | 4000 | 0124 | 0100 | 0000 | 9207 | bf84 | 9410 | 2000 | 9610 | 2000 | 4000 | 0591 |
| 3665640 | 9810 | 0015 | 80a2 | 3fff | 0280 | 001e | 8090 | 0008 | 3280 | 0028 | 9210 | 2010 | de06 | a01c | d006 | a020 | ae05 | c00f | b006 | 0008 | 80a6 | 0016 | 2680 | 0007 |
| 3665720 | d207 | bff4 | b026 | 0016 | 80a6 | 0016 | 16bf | fffe | ae05 | e001 | d207 | bff4 | 80a5 | c009 | 26bf | ff9f | d006 | 8000 | 80a5 | c009 | 3280 | 0007 | 9810 | 2005 |
| 3666000 | d607 | bff8 | 80a6 | 000b | 26bf | ff98 | d006 | 8000 | 9810 | 2005 | b610 | 2005 | 1080 | 0073 | d826 | a02c | 1b00 | 0295 | da03 | 61c8 | 80a3 | 6004 | 22bf | ffd1 |
| 3666060 | 9a10 | 2020 | 1f00 | 0295 | de03 | e1c8 | 9010 | 2004 | de26 | a030 | b610 | 2004 | 1080 | 0067 | d026 | a02c | d227 | bf80 | d406 | a05c | d006 | 8000 | 9210 | 0019 |
| 3666140 | 9610 | 2000 | 9a07 | bf80 | 4000 | 0554 | 9a07 | bf70 | b610 | 0008 | 8090 | 001b | 3680 | 0008 | 8090 | 001b | 1500 | 0295 | d402 | a1c8 | 80a2 | a004 | 22bf | fff1 |
| 3666220 | 9210 | 2010 | 8090 | 001b | 3680 | 000e | 80a6 | e004 | 1700 | 0295 | d602 | e1c8 | 80a2 | e023 | 22bf | ffb1 | 9a10 | 2020 | 1900 | 0295 | d803 | 21c8 | 9a10 | 2004 |
| 3666300 | d826 | a030 | b610 | 2004 | 1080 | 0047 | da26 | a02c | 26bf | ffa8 | 9a10 | 2020 | de06 | a058 | de03 | c000 | d206 | a060 | 80a2 | 400f | 32bf | ffa2 | 9a10 | 2020 |
| 3666360 | 9610 | 2001 | 9210 | 0019 | 9410 | 001b | 4000 | 044b | 9007 | bf58 | 9007 | bf58 | 4000 | 01a2 | 9207 | bfc4 | 8090 | 0008 | 2280 | 0032 | 9610 | 2002 | d207 | bf54 |
| 3666440 | 4000 | 021e | 9007 | bfc4 | d406 | a02c | 8090 | 000a | 3290 | 001b | d807 | bffc | d007 | a044 | 9207 | bfd0 | c202 | 0000 | c200 | 6020 | c200 | 6008 | 9fc0 | 4000 |
| 3666520 | d002 | 0000 | 8090 | 0003 | 3280 | 0007 | d407 | bfd4 | 9010 | 2007 | d026 | a02c | 9210 | 2006 | d226 | a030 | d407 | bfd4 | 8090 | 000a | 2280 | 001b | f606 | a02c |
| 3666600 | 9610 | 2002 | d624 | c000 | 9010 | 0013 | 4000 | 0121 | 9207 | bfd0 | 1080 | 0014 | f606 | a02c | 8090 | 000c | 2480 | 0011 | f606 | a02c | d007 | a044 | c202 | 0000 |
| 3666660 | c200 | 6020 | c200 | 600c | 9fc0 | 4000 | d002 | 0000 | 9090 | 0008 | 2280 | 0008 | f606 | a02c | d407 | bffc | 9422 | a001 | 10bf | fef8 | d427 | bffc | d626 | a02c |
| 3666740 | f606 | a02c | 81c7 | e008 | 91e8 | 001b | d002 | 2008 | 9002 | 202c | d402 | 0000 | d602 | 2004 | d422 | 6000 | d002 | 2008 | d622 | 6004 | 81c3 | e008 | d022 | 6008 |
| 3667020 | 9de3 | bfa0 | f006 | 2008 | 9210 | 2002 | 9006 | 2038 | d222 | 0000 | 9210 | 001a | 8210 | 0019 | 9fc0 | 4000 | 0100 | 0000 | 81c7 | e008 | 91e8 | 0008 | 81c3 | e008 |
| 3667100 | 0100 | 0000 | d002 | 2008 | 9222 | 6001 | 90a2 | 6004 | 1880 | 002e | 932a | 6002 | 1900 | 05d5 | 9813 | 22fc | d602 | 400c | 81c2 | c000 | 0100 | 0000 | 0017 | 5710 |
| 3667160 | 0017 | 5728 | 0017 | 5770 | 0017 | 5740 | 0017 | 5758 | da02 | 8000 | d402 | a004 | 9002 | 2024 | da22 | 2000 | 1080 | 0020 | d422 | 2004 | 9002 | 2024 | c202 | 0000 |
| 3667240 | d002 | 2004 | c222 | a000 | 1080 | 001a | d022 | a004 | c402 | 8000 | d402 | a004 | 9002 | 201c | c422 | 2000 | 1080 | 0014 | d422 | 2004 | 9002 | 201c | c602 | 0000 |
| 3667320 | d002 | 2004 | c622 | a000 | 1080 | 000e | d022 | a004 | 9002 | 2008 | d602 | 0000 | d802 | 2004 | d622 | a000 | d602 | 2008 | d822 | a004 | d002 | 200c | d622 | a008 |
| 3667400 | 1080 | 0004 | d022 | a00c | 1080 | 0003 | 9010 | 2000 | 9010 | 2001 | 81c3 | e008 | 0100 | 0000 | 9de3 | bfa0 | fa06 | 2008 | d007 | 6004 | 8090 | 0008 | 2280 | 0005 |
| 3667460 | c207 | 603c | 7ffd | 7171 | d007 | 4000 | c207 | 603c | 9007 | 6038 | c200 | 601c | 9fc0 | 4000 | 0100 | 0000 | 7ffa | 8566 | 9010 | 001d | 7ffa | 8564 | 9010 | 0018 |
| 3667540 | 81c7 | e008 | 81e8 | 0000 | 1500 | 05de | d402 | a098 | 9090 | 000a | 3280 | 0017 | 0700 | 05de | 1500 | 05de | 1300 | 05d4 | 9212 | 61ac | 9412 | a098 | 1700 | 05d5 |
| 3667620 | 9612 | e2cc | d222 | a000 | 1b00 | 05d5 | 9a13 | 627c | d622 | a004 | 1900 | 05d5 | 9813 | 22a0 | da22 | a008 | 0300 | 05d5 | 8210 | 63ac | d822 | a00c | 0500 | 05d5 |
| 3667700 | 8410 | a2d4 | c222 | a010 | c422 | a014 | 0700 | 05de | 81c3 | e008 | 9000 | e098 | 636c | 6e74 | 7564 | 705f | 6372 | 6561 | 7465 | 3a20 | 6f75 | 7420 | 6f66 | 206d |
| 3667760 | 656d | 6f72 | 790a | 0063 | 6c6e | 7475 | 6470 | 5f63 | 7265 | 6174 | 653a | 206f | 7574 | 206f | 6620 | 6d65 | 6d6f | 7279 | 0a00 | 0000 | 9de3 | bfc0 | 1100 | 05de |
| 3670040 | d002 | 20b0 | 8090 | 0008 | 3280 | 0007 | 1500 | 05de | 7fff | 72fa | 0100 | 0000 | 1300 | 05de | d022 | 60b0 | 1500 | 05de | f002 | a0b0 | 81c7 | e008 | 81e8 | 0000 |
| 3670120 | 9de3 | bf80 | 9010 | 3fff | d027 | bff8 | c037 | bffe | 9210 | 206f | d236 | 2002 | 9410 | 2190 | d423 | a05c | 1900 | 05d6 | 9813 | 2228 | da03 | 0000 | d803 | 2004 |

```
3670200 9603 a060 1a22 e000 d822 e004 1300 0061 9212 62a0 9807 bff8 9a10 2190 9410 2002 7fff fd62 9010 0018 ba10 0008 8090 001d
3670260 0280 0032 0100 0000 c027 bff4 f627 bff0 f427 bfec f227 bfe8 c207 6004 2500 05d6 c200 4000 a414 a230 e604 8000 e404 a004
3670340 a203 a060 e624 6000 e424 6004 1900 05d8 1500 05d6 9412 a238 9813 20b4 e223 a05c 9010 001d 9210 2003 9a07 bffe 9fc0 4000
3670420 9607 bfe8 8090 c008 2280 000d f817 bffe 2d00 05d3 aa10 200e ea25 a000 c207 6004 1300 05dd c200 6008 9212 6004 9fc0 4000
3670500 9010 001d 1080 0009 c207 6004 8090 001c 3280 0006 c207 6004 1500 05dd 9210 200f d222 a000 c207 6004 9010 001d c200 6010
3670560 9fc0 4000 0100 0000 7ffd 70e0 d007 bff8 c036 2002 f017 bffe b12c 2010 b136 2010 81c7 e008 81e8 0000 0000 0005 0000 0000
3670640 0000 003c 0000 c000 9de3 bfa0 9010 0018 4000 015e 9210 0019 8090 0008 2280 0012 b010 2000 9010 0018 4000 0158 9206 6004
3670720 8090 0008 2280 000c b010 2000 9010 0018 4000 0152 9206 6008 8090 0008 2280 0006 b010 2000 9010 0018 4000 014c 9206 600c
3671000 b010 0008 81c7 e008 81e8 0000 0000 0000 9de3 bfa0 9010 0018 4000 01ee 9210 0019 8090 0008 2280 0008 b210 2000 9610 2190
3671060 9010 0018 9206 6004 4000 0231 9406 6008 b210 0008 81c7 e008 91e8 0019 9de3 bfa0 9010 0018 9210 0019 4000 01e4 9410 2008
3671140 81c7 e008 91e8 0008 9de3 bfa0 9010 0018 7fff ffe8 9210 0019 8090 0008 3280 0004 9010 0019 1080 0020 b210 2000 4000 01d1
3671220 9206 600c 8090 0008 3280 0004 d006 600c 1080 0019 b210 2000 8090 0008 0280 0006 80a2 2002 2280 000a 9010 0018 1080 0012
3671300 b210 2001 c206 6014 d206 6010 9fc0 4000 9010 0018 1080 000c b210 0008 4000 0113 9206 6010 8090 0008 3280 0004 9010 0018
3671360 1080 0005 b210 2000 4000 010c 9206 6014 b210 0008 81c7 e008 91e8 0019 9de3 bfa0 9010 0018 4000 01af 9210 0019 8090 0008
3671440 3280 0004 d006 4000 1080 0018 b210 2000 8090 0008 0280 0006 80a2 2001 2280 0010 9010 0018 1080 0011 b210 2000 9010 0018
3671520 4000 00f6 9206 6004 8090 0008 3280 0004 9010 0018 1080 0009 b210 2000 4000 00ef 9206 6008 1080 0005 b210 0008 4000 0195
3671600 9206 6004 b210 0008 81c7 e008 91e8 0019 9de3 bf88 1100 05d6 9012 22f8 9210 2001 1500 05d6 d227 bff0 d027 bfec 9412 a39c
3671660 9610 3fff d627 bff8 d427 bff4 9010 0018 9210 0019 c027 bfe8 4000 00d8 c027 bffc 8090 0008 2280 0013 b210 2000 9010 0018
3671740 4000 017c 9206 6004 8090 0008 2280 000d b210 2000 d806 6004 80a3 2001 3280 0009 b210 2000 9810 2000 9010 0018 9607 bfe8
3672020 9206 6008 4000 01ff 9406 600c b210 0008 81c7 e008 91e8 0019 9de3 bfa0 c026 6004 9010 2002 d026 6008 d206 0000 8090 0009
3672100 3280 001e b210 2000 9210 0019 4000 00b7 9010 0018 8090 0008 2280 0010 b210 2000 9010 0018 4000 015b 9206 6004 8090 0008
3672160 2280 0012 b210 2000 9010 0018 4000 00ab 9206 6008 8090 0008 2280 000c b210 2000 9010 0018 4000 00a5 9206 600c 8090 0008
3672240 2280 0006 b210 2000 9010 0018 4000 009f 9206 6010 b210 0008 81c7 e008 91e8 0019 80a2 2005 1880 001e 832a 2002 0500 05d7
3672320 8410 a170 c200 4002 81c0 4000 0100 0000 0017 5dc4 0017 5d88 0017 5d94 0017 5da0 0017 5dac 0017 5db8 8210 2008 1080 0014
3672400 c222 4000 8410 2009 1080 0011 c422 4000 9410 200a 1080 000e d422 4000 9610 200b 1080 000b d622 4000 9810 200c 1080 0008
3672460 d822 4000 1080 0006 c022 4000 9a10 2010 da22 4000 c022 6004 d022 6008 81c3 e008 0100 0000 80a2 2001 0280 000d 80a2 2006
3672540 2280 0009 9810 2006 9410 2010 d422 4000 9610 2001 d622 6004 d022 6008 81c3 e008 0100 0000 10bf fffe d822 4000 9a10 2007
3672620 10bf fffb da22 4000 9de3 bfa0 d006 2008 8090 0008 0280 0012 80a2 2001 2280 001a d006 200c 9210 2010 d226 4000 d406 2008
3672700 d426 6004 d606 4000 80a2 2006 0280 0016 80a2 2007 0280 0019 80a2 2009 2280 001a de06 201c 81c7 e008 81e8 0000 d006 2018
3672760 8090 0008 3280 0004 d006 2018 10bf fffa c026 4000 7fff ffaf 9210 0019 10bf ffef d006 4000 7fff ffd0 9210 0019 10bf ffeb
3673040 d006 4000 d606 2010 d626 6004 f006 2014 10bf ffed f026 6008 f006 2010 10bf ffea f026 6004 de26 6004 f006 2020 10bf ffe6
3673120 f026 6008 0000 0000 9de3 bf88 9010 2002 d027 bfe8 9007 bfe8 9210 0019 8210 0018 9fc0 4000 0100 0000 81c7 e008 81e8 0000
3673200 81c3 e008 9000 2001 9de3 bfa0 9010 0018 4000 000a 9210 0019 81c7 e008 91e8 0008 9de3 bfa0 9010 0018 4000 0020 9210 0019
3673260 81c7 e008 91e8 0008 9de3 bfa0 d006 0000 8090 0008 3280 0009 d406 0000 c206 2004 9210 0019 c200 6004 9fc0 4000 9010 0018
3673340 1080 0010 b010 0008 80a2 a001 3280 0009 f006 0000 c206 2004 9210 0019 c200 4000 9fc0 4000 9010 0018 1080 0006 b010 0008
3673420 90a6 2002 3280 0003 b010 2000 b010 2001 81c7 e008 81e8 0000 9de3 bfa0 d006 0000 80a2 2001 3280 0009 d406 0000 c206 2004
3673500 9210 0019 c200 4000 9fc0 4000 9010 0018 1080 0010 b010 0008 8090 000a 3280 0009 f006 0000 c206 2004 9210 0019 c200 6004
3673560 9fc0 4000 9010 0018 1080 0006 b010 0008 80a6 2002 3280 0003 b010 2000 b010 2001 81c7 e008 81e8 0000 9de3 bf98 d006 0000
3673640 8090 0008 0280 0008 80a2 2001 0280 0010 80a2 2002 0280 001a b010 2000 81c7 e008 81e8 0000 f256 4000 9010 0018 f227 bffc
3673720 c206 2004 9207 bffc c200 6004 9fc0 4000 0100 0000 10bf fff6 b010 0008 c206 2004 9010 0018 c200 4000 9fc0 4000 9207 bffc
3674000 8090 0008 22bf ffee b010 2000 d807 bffc b010 2001 10bf ffea d836 4000 10bf ffe8 b010 2001 9de3 bf98 d006 0000 8090 0008
3674060 0280 0008 80a2 2001 0280 0010 80a2 2002 0280 001a b010 2000 81c7 e008 81e8 0000 f216 4000 9010 0018 f227 bffc c206 2004
3674140 9207 bffc c200 6004 9fc0 4000 0100 0000 10bf fff6 b010 0008 c206 2004 9010 0018 c200 4000 9fc0 4000 9207 bffc 8090 0008
3674220 22bf ffee b010 2000 d807 bffc b010 2001 10bf ffea d836 4000 10bf ffe8 b010 2001 9de3 bf98 d04e 4000 9207 bffc d027 bffc
3674300 7fff ff72 9010 0018 8090 0008 3280 0004 d407 bffc 1080 0004 b210 2000 d42e 4000 b210 2001 81c7 e008 91e8 0019 9de3 bf98
3674360 d04e 4000 9207 bffc d027 bffc 7fff ff69 9010 0018 8090 0008 3280 0004 d407 bffc 1080 0004 b210 2000 d42e 4000 b210 2001
3674440 81c7 e008 91e8 0019 9de3 bf98 d006 0000 9090 0008 0280 0008 80a2 2001 0280 0013 80a2 2002 0280 0021 b010 2000 81c7 e008
3674520 81e8 0000 f206 4000 8090 0019 2280 0003 b210 2000 b210 2001 f227 bffc c206 2004 9010 0018 c200 6004 9fc0 4000 9207 bffc
3674600 10bf fff3 b010 0008 c206 2004 9010 0018 c200 4000 9fc0 4000 9207 bffc 8090 0008 22bf ffeb b010 2000 d607 bffc 8090 000b
3674660 3280 0003 b010 2001 b010 2000 f026 4000 10bf ffe3 b010 2001 10bf ffe1 b010 2001 9de3 bfa0 9010 0018 7fff ff38 9210 0019
3674740 81c7 e008 91e8 0008 9de3 bfa0 8090 001a 3280 0004 ba10 2003 1080 003f b010 2001 ba0e 801d 8090 001d 2280 0005 d806 0000
3675020 9410 2004 ba22 801d d806 0000 80a3 2001 3280 0018 e006 0000 c206 2004 9410 001a c200 6008 9210 0019 9fc0 4000 9010 0018
3675100 9090 0008 2280 002c b010 2000 8090 001d 3280 0004 c206 2004 1080 0027 b010 2001 1300 05de c200 6008 9212 60b8 9410 001d
3675160 9fc0 4000 9010 0018 1080 001f b010 0008 8090 0010 3280 0018 f006 0000 c206 2004 9410 001a c200 600c 9210 0019 9fc0 4000
3675240 9010 0018 8090 0008 2280 0013 b010 2000 8090 001d 3280 0004 c206 2004 1080 000e b010 2001 1300 05d9 c200 600c 9212 6278
```

```
3675320  9410 001d 9fc0 4000 9010 0018 1080 0006 b010 0008 80a6 2002 3280 0003 b010 2000 b010 2001 81c7 e008 81e8 0000 9de3 bfa0
3675400  fa06 4000 9010 0018 7fff fee6 9210 001a 8090 0008 2280 0035 ba10 2000 f406 8000 80a6 801b 0880 0029 d006 0000 80a2 2002
3675460  228c 0026 d006 0000 1080 002c ba10 2000 8090 001a 3280 0004 8090 001d 1080 0027 ba10 2001 3280 0007 8090 001d 7ffa 818c
3675540  9010 001a ba10 0008 fa26 4000 8090 001d 3280 000a 9410 001a 1300 05d9 1100 0294 9012 2370 7fff ed2f 9212 6280 1080 0017
3675620  ba10 2000 9410 001a 9210 001d 7fff ff93 9010 0018 1080 0011 ba10 0008 0280 0005 0100 0000 7ffa 824d 9010 001d c026 4000
3675700  1080 000a ba10 2001 8090 0008 02bf fff2 90a2 2001 02bf ffdb 80a2 2002 22bf fff4 8090 001d ba10 2000 81c7 e008 91e8 001d
3675760  9de3 bfa0 9206 6004 9010 0018 9410 0019 7fff ffbf 9610 2400 81c7 e008 91e8 0008 9de3 bfa0 9010 0018 7fff ff6e 9210 0019
3676040  8090 0008 3280 0004 f206 4000 1080 001a b610 2000 d006 e004 8090 0008 2280 000d 8090 001c d206 c000 80a2 4019 3280 0004
3676120  b606 e006 1080 000b c206 e004 d006 e004 8090 0008 32bf fff9 d206 c000 8090 001c 3280 0004 8210 001c 1080 0007 b610 2000
3676200  9410 3fff 9210 001a 9fc0 4000 9010 0018 b610 0008 81c7 e008 91e8 001b 9de3 bf98 fa06 4000 d006 0000 8090 0008 0280 0007
3676260  80a2 2002 3280 0009 9010 0018 8090 001d 2280 003c ba10 2001 7fff 6dae 9010 001d d027 bffc 9010 0018 7fff fe72 9207 bffc
3676340  8090 0008 3290 0004 d207 bffc 1080 0031 ba10 2000 80a2 401a 2880 0004 d006 0000 1080 002c ba10 2000 f407 bffc 8090 0008
3676420  b406 a001 0280 001d 80a2 2001 0280 0006 80a2 2002 0280 001f 0100 0000 1080 0021 ba10 2000 8090 001a 2280 001e ba10 2001
3676500  8090 001d 3280 0007 8090 001d 7ffa 8110 9010 001a ba10 0008 fa26 4000 8090 001d 3290 0009 d807 bffc 1300 05d9 1100 0294
3676560  9012 2370 7fff ecb3 9212 629a 1080 000d ba10 2000 c02f 400c d407 bffc 9210 001d 7fff ff16 9010 0018 1080 0006 ba10 0008
3676640  7ffa 8132 9010 001d c026 4000 ba10 2001 81c7 e008 91e8 001d 9de3 bfa0 9010 0018 9210 0019 7fff ffb6 9410 3fff 8090 0008
3676720  2280 0003 b010 2000 b010 2001 81c7 e008 81e8 0000 0000 0000 0000 0000 0000 0000 7864 725f 6279 7465 733a 206f 7574 206f
3677000  6620 6d65 6d6f 7279 0a00 7864 725f 7374 7269 6e67 3a20 6f75 7420 6f66 206d 656d 6f72 790a 0000 0000 9de3 bfc0 4000 006b
3677060  f626 0000 d026 2004 f226 2010 f226 200c f426 2014 81c7 e008 81e8 0000 81c3 e008 0100 0000 d602 2014 96a2 e004 1c80 0004
3677140  d622 2014 1080 0009 9010 2000 d402 200c d402 8000 d422 4000 d802 200c 9803 2004 d822 200c 9010 2001 81c3 e008 0100 0000
3677220  d602 2014 96a2 e004 1c80 0004 d622 2014 1080 0009 9010 2000 d402 200c d202 4000 d222 8000 d802 200c 9803 2004 d822 200c
3677300  9010 2001 81c3 e008 0100 0000 9de3 bfa0 d006 2014 90a2 001a 1c80 0004 d026 2014 1080 000a b010 2000 d006 200c 9410 001a
3677360  7fff f6b2 9210 0019 d606 200c 9602 c01a d626 200c b010 2001 81c7 e008 81e8 0000 9de3 bfa0 d006 2014 90a2 001a 1c80 0004
3677440  d026 2014 1080 000a b010 2000 d206 200c 9410 001a 7fff f6a1 9010 0019 d606 200c 9602 c01a d626 200c b010 2001 81c7 e008
3677520  81e8 0000 d202 2010 d002 200c 81c3 e008 9022 0009 da02 2010 d602 200c 9a03 4009 d202 2014 9202 c009 9810 000d 80a3 0009
3677600  2480 0004 9222 400c 1080 0005 9010 2000 da22 200c d222 2014 9010 2001 81c3 e008 0100 0000 d402 2014 80a2 8009 0680 0009
3677660  9a10 2000 d802 2014 9823 0009 d822 2014 da02 200c d602 200c 9602 c009 d622 200c 81c3 e008 9000 000d 1900 05de d803 20c8
3677740  8090 000c 3280 001d 1500 05de 1300 05de 1300 05d9 9212 62e4 9813 20c8 1700 05d9 9612 e320 d223 2000 1b00 05d9 9a13 635c
3700020  d623 2004 0300 05d9 8210 63a0 da23 2008 0500 05d9 8410 a3e4 c223 200c 0700 05d9 8610 e3f4 c423 2010 0900 05da 8811 2034
3700100  c623 2014 1100 05d9 9012 22dc c823 2018 d023 201c 1500 05de 81c3 e008 9002 a0c8 9de3 bf88 111f ffff 9012 23ff 9410 2042
3700160  d437 bffc d027 bfec 9010 0019 94c7 bfec f027 bff0 f027 bff4 7fff 6618 9210 001a d607 bff0 c02a c000 81c7 e008 81e8 0000
3700240  8210 2068 91d0 2000 1a80 0004 1b00 0345 9a13 61c0 81c3 4000 0100 0000 81c3 e008 0100 0000 0000 0000 8210 2062 91d0 2000
3700320  1a80 0004 1b00 0345 9a13 61c0 81c3 4000 0100 0000 81c3 e008 0100 0000 0000 0000 8210 2029 91d0 2000 1a80 0004 1b00 0345
3700400  9a13 61c0 81c3 4000 0100 0000 81c3 e008 0100 0000 0000 0000 8210 205a 91d0 2000 1a80 0004 1b00 0345 9a13 61c0 81c3 4000
3700460  0100 0000 81c3 e008 0100 0000 0000 0000 8210 205c 91d0 2000 1a80 0004 1b00 0345 9a13 61c0 81c3 4000 0100 0000 81c3 e008
3700540  0100 0000 0000 0000 8210 20a2 91d0 2000 1a80 0004 1b00 0345 9a13 61c0 81c3 4000 0100 0000 81c3 e008 0100 0000 0000 0000
3700620  8210 2096 91d0 2000 1a80 0004 1b00 0345 9a13 61c0 81c3 4000 0100 0000 81c3 e008 0100 0000 0000 0000 8210 207d 91d0 2000
3700700  1a80 0004 1b00 0345 9a13 61c0 81c3 4000 0100 0000 81c3 e008 0100 0000 0000 0000 8210 205d 91d0 2000 1a80 0004 1b00 0345
3700760  9a13 61c0 81c3 4000 0100 0000 81c3 e008 0100 0000 0000 0000 8210 2085 91d0 2000 1a80 0004 1b00 0345 9a13 61c0 81c3 4000
3701040  0100 0000 81c3 e008 0100 0000 0000 0000 8210 2053 91d0 2000 1a80 0004 1b00 0345 9a13 61c0 81c3 4000 0100 0000 81c3 e008
3701120  0100 0000 0000 0000 8210 206d 91d0 2000 1a80 0004 1b00 0345 9a13 61c0 81c3 4000 0100 0000 81c3 e008 0100 0000 0000 0000
3701200  8210 206f 91d0 2000 1a80 0004 1b00 0345 9a13 61c0 81c3 4000 0100 0000 81c3 e008 0100 0000 0000 0000 8210 206e 91d0 2000
3701260  1a80 0004 1b00 0345 9a13 61c0 81c3 4000 0100 0000 81c3 e008 0100 0000 0000 0000 8210 2061 91d0 2000 1a80 0004 1b00 0345
3701340  9a13 61c0 81c3 4000 0100 0000 81c3 e008 0100 0000 0000 0000 9022 3ff8 80a2 200a 1880 0022 912a 2002 1300 05da 9212 63ac
3701420  d402 c009 81c2 8000 0100 0000 0017 6c10 0017 6c00 0017 6c18 0017 6c08 0017 6c18 0017 6bf8 0017 6bf0 0017 6be8 0017 6c18
3701500  0017 6bd8 0017 6be0 108c 0011 9010 2000 1080 000f 9010 2008 1080 000d 9010 2004 1080 000b 9010 2003 1080 0009 9010 2005
3701560  1080 0007 9010 2001 1080 0005 9010 200d 1080 0003 9010 200e 9010 2006 81c3 e008 0100 0000 0000 0000 9de3 bf80 9207 bff0
3701640  c022 6004 c022 4000 f022 6008 c022 600c 9407 bfe0 7fff ff9f 9010 2000 8090 0008 3680 0004 d207 bfec 1080 0009 ba10 3fff
3701720  8090 0009 2280 0006 fa07 bfe8 d407 bfe8 9402 a001 d427 bfe8 fa07 bfe8 81c7 e008 91e8 001d 0900 0000 9de3 bfa0 7fff 8b36
3702000  9010 0018 4000 00b5 0100 0000 81c7 e008 91e8 0008 0000 0000 9de3 bf90 8090 0019 3280 0038 d456 4000 b207 bff0 9010 0019
3702060  7ffa 814c 9210 2010 9210 2002 d236 4000 1f00 05de de53 e0e8 8090 000f 3280 0009 2900 0295 7fff eb57 2500 05de 7fff 4df9
3702140  9210 21a8 9002 2258 d034 a0e9 2900 0295 a610 2030 e625 21c8 ba10 2000 b810 3fff 8090 001c 3680 001d ba10 001c 2b00 0295
3702220  ea05 61c8 80a5 6030 3280 0018 ba10 001c 1100 05de ec52 20e8 ec36 6002 ee52 20e8 ae05 e001 ee32 20e8 d052 20e8 80a2 23ff
3702300  2480 0006 9410 2010 1500 05de 9210 2258 d232 a0e8 9410 2010 9210 0019 7fff fef1 9010 0018 ba07 6001 80a7 61a8 06bf ffe5
3702360  b810 0008 ba10 001c 81c7 e008 91e8 001d 80a2 a002 22bf ffd0 1f00 05de 1b00 0295 9810 202e ba10 3fff 10bf fff8 d823 61c8
```

```
3702440  9de3 bf88 1100 05de fa02 20f0 8090 001d 3280 000d d407 603c 9210 2040 7ffa 812f 9010 2001 ba10 0009 8090 001d 3280 0004
3702520  1300 05de 1080 002e ba10 2000 fa22 60f0 d407 603c 8090 000a 1280 0029 1100 05dc 9012 23f0 da02 0000 de02 2004 9607 600c
3702600  da22 e000 d802 2008 de22 e004 d822 e008 e402 0000 e602 2004 e427 6003 d002 2008 e627 6004 4000 0034 d027 6008 d027 6020
3702660  b807 bfe8 9010 001c 9207 6028 9410 2014 7fff fe1a 9610 2000 9010 001c 7fff fb11 9210 001d 9207 600c 7fff fb0e 9010 001c
3702740  c207 2004 9010 001c c200 6010 9fc0 4000 0100 0000 d027 603c c207 2004 9010 001c c200 601c 9fc0 4000 0100 0000 81c7 e008
3703020  91e8 001d 9de3 bfa0 1100 05de fa02 20f0 8090 001d 3290 0004 c206 6004 1080 0008 ba10 2000 9010 0019 c200 600c d407 603c
3703100  9fc0 4000 9207 6028 ba10 0009 81c7 e008 91e8 001d 81c3 e009 0100 0000 81c3 e008 9000 2001 81c3 e008 9000 2000 81c3 e008
3703160  0100 0000 1500 05de d402 a0f4 8090 000a 3280 0014 0500 05de 1500 05de 1300 05db 9212 62e4 9412 a0f4 1700 05db 9612 e2a4
3703240  d222 a000 1b00 05db 9a13 62ec d622 a004 1900 05db 9813 22f4 da22 a008 0300 05db 8210 62fc d822 a00c c222 a010 0500 05de
3703320  81c3 e008 9000 a0f4 9de3 bfa0 1100 05de b402 2108 1300 05dc b802 6390 ba10 001a f64f 0000 b807 2001 f62f 4000 8090 001b
3703400  12bf fffc ba07 6001 f806 2018 1900 05dc 972f 2001 b807 000b 9813 23aa b807 000c de4f 0000 b807 2001 de2e 8000 e44f 0000
3703460  9006 a001 e42a 0000 b807 2001 f84f 0000 9002 2001 f82a 0000 b206 2010 f806 4000 1500 05dc 932f 2001 b807 0009 9412 a3c0
3703540  b807 000a d84f 0000 9002 2001 9002 2001 d82a 0000 b807 2001 e04f 0000 9002 2001 e02a 0000 b807 2001 f84f 0000 9002 2001
3703620  f82a 0000 b826 6004 d207 0000 4000 001c 9002 2001 b827 2004 d207 0000 b827 2004 4000 0017 9202 6064 d207 0000 4000 0014
3703700  9202 6064 9227 2004 d202 4000 4000 0010 9202 6064 ba10 0008 d006 2014 9210 2064 7ffd ebea 9002 276c 9210 0008 4000 0008
3703760  9010 001d d206 2014 9022 2001 4000 0004 9202 6064 81c7 e008 91e8 001a 9de3 bfa0 80a6 600a 0680 000a b006 2001 9210 200a
3704040  7ffd ebda 9010 0019 7fff 4d06 9210 200a 9002 2030 1080 0004 d02e 0000 9610 2020 d62e 0000 9210 200a 7fff 4cfe 9010 0019
3704120  9002 2030 b006 2001 d02e 0000 b006 2001 81c7 e008 81e8 0000 0016 c02c 0016 c254 0016 c3a4 0016 c4a4 0016 c630 0016 c6a0
3704200  0016 c000 0000 0000 4028 2329 3838 2f31 312f 3032 2064 6972 6563 746f 7279 2e63 0932 372e 3100 0000 0000 0000 0000 0000
3704260  2a00 0000 2e00 0000 2e2e 0000 0000 0000 2e00 2e2f 002e 2f00 2f65 7463 2f67 726f 7570 0000 0000 0000 7200 7200 2b00 6772
3704340  6f75 702e 6279 6e61 6d65 0067 726f 7570 2e62 796e 616d 6500 6772 6f75 702e 6279 6e61 6d65 002b 002b 0025 6400 6772 6f75
3704420  702e 6279 6769 6400 0000 0000 0000 0000 2f65 7463 2f70 6173 7377 6400 7200 7200 2b00 2a00 2a00 2b00 2b00 7061 7373 7764
3704500  2e62 796e 616d 6500 7061 7373 7764 2e62 796e 616d 6500 7061 7373 7764 2e62 796e 616d 6500 2564 0070 6173 7377 642e 6279
3704560  7569 6400 0000 0000 0000 0000 0000 0000 2e2f 0067 6574 7764 3a20 6361 6e27 7420 7374 6174 202e 002f 0067 6574 7764 3a20
3704640  6361 6e27 7420 7374 6174 202f 002e 2e2f 0067 6574 7764 3a20 6361 6e27 7420 6f70 656e 202e 2e00 6765 7477 643a 2063 616e
3704720  2774 2073 7461 7420 2e2e 0067 6574 7764 3a20 7265 6164 2065 7272 6f72 2069 6e20 2e2e 0067 6574 7764 3a20 7265 6164 2065
3705000  7272 6f72 2069 6e20 2e2e 002f 002f 002f 746d 702f 2e67 6574 7764 002f 746d 702f 2e67 6574 7764 002f 6574 632f 6d74 6162
3705060  002f 746d 702f 2e67 6574 7764 002f 746d 702f 2e67 6574 7764 5858 5858 5858 002f 6574 632f 6d74 6162 0072 002f 746d 702f
3705140  2e67 6574 7764 002f 746d 702f 2e67 6574 7764 0000 0000 0000 0000 0000 0000 0000 2573 2025 7320 2573 2025 7320 2564 2025
3705220  640a 0000 0000 0000 4028 2329 7374 726e 6370 792e 6320 312e 3620 3838 2f30 322f 3038 2053 4d49 0000 2f64 6576 2f6c 6f67
3705300  0000 0000 2f64 6576 2f63 6f6e 736f 6c65 0000 0000 0000 0000 7379 736c 6f67 003c 2564 3e00 252e 3135 7320 005b 2564 5d00
3705360  3a20 0065 7272 6f72 2025 6400 0d00 0000 4461 7920 416f 6e20 3030 2030 303a 3030 3a30 3020 3139 3030 0a00 5375 6e4d 6f6e
3705440  5475 6557 6564 5468 7546 7269 5361 7400 4a61 6e46 6562 4d61 7241 7072 4d61 794a 756e 4a75 6c41 7567 5365 704f 6374 4e6f
3705520  7644 6563 0000 0000 0000 0000 0000 0000 0000 0000 0000 0000 0000 0000 0000 0000 0000 0000 0000 0000 0000 0000 0000 0000
3705600  0000 0000 0000 0000 0000 0000 0000 0000 0000 0000 0000 0000 0000 0000 0000 0000 0000 0000 0000 0000 0000 0000 0000 0000
*
3710520  0000 0000 0000 0000 0000 0000 0000 0000 0000 0000 0000 0000 0000 0000 0000 0000 0000 78b7 b328 11f1 0016 be0c 0000 0000
3710600  0000 78bf b328 11ad 0016 be38 0000 0000 0000 79a7 b328 116d 0016 be64 0000 0000 0000 78af b328 1129 0016 be90 0000 0000
3710660  0000 78ff b328 10e9 0016 bebc 0000 0000 000f 4dd8 0000 0000 0017 7a40 0017 7a50 0000 78df b328 1065 0016 bee8 0000 0000
3710740  0000 79df b328 1021 0016 bf14 0000 0000 2c78 0024 0002 438a 7ae4 0000 8148 813c 8068 805c 7ebc 0000 0016 c02c 0010 8924
3711020  0018 228c 2c78 0022 0002 438a 7ae4 0008 7ed4 7ed4 7ebc 0000 0016 c254 0008 88ec 8b44 8b58 228c 0ed9 2c78 0020 0002 438a
3711100  7ae4 0004 7ed4 8130 8124 7c28 0016 c630 000c 8908 8b6c 228c 2c78 001a 0002 438a 7ae4 0000 7ebc 0000 0016 c000 0000 8b4c
3711160  228c 7af6 b464 03d1 0016 bfc4 0000 000c 0015 a64c 0000 0010 0017 7f48 0000 0008 2aa8 0000 0017 a588 0017 a540 0010 7265
3711240  6164 5f6c 7665 725f 7265 706f 7274 00ec 27f0 000c 0017 a394 54f8 228c 0016 8d68 0100 7847 0000 3287 0000 0004 0016 43c4
3711320  0016 43c4 0041 0000 0000 0000 0016 8de8 0200 784f 0000 3287 0000 0008 0016 43ac 0016 43ac 0041 0000 0000 0000 0017 7b6c
3711400  0300 784f 0000 3287 0000 000c 0016 4334 0016 4334 0041 0000 0000 0000 0017 7b8c 0400 784f 0000 3287 0000 0010 0016 bff0
3711460  0016 bff0 0041 0000 0000 0000 0016 8e58 0100 7857 0000 3287 0000 0004 0017 7bec 0017 7bec 0041 0000 0000 0000 2c78 0010
3711540  0002 438a 239c 0000 0016 8e18 0017 7bcc 0200 7857 0000 3287 0000 0008 0017 7c1c 0017 7c1c 0041 0000 0000 0000 2c78 0010
3711620  0002 438a 239c 0000 0016 8e48 0017 7bfc 0300 7857 0000 3287 0000 000c 0017 7c4c 0017 7c4c 0041 0000 0000 0000 2c78 0010
3711700  0002 438a 239c 0000 0016 8e68 0016 8ea8 0200 785f 0000 3287 0000 0008 0017 7c7c 0017 7c7c 0041 0000 0000 0000 2c78 0010
3711760  0002 438a 239c 0000 0016 8e88 0017 7c5c 0300 785f 0000 3287 0000 000c 0017 7cac 0017 7cac 0041 0000 0000 0000 2c78 0010
3712040  0002 438a 239c 0000 0016 8eb8 0016 8f18 0200 7867 0000 3287 0000 0008 0017 7cdc 0017 7cdc 0041 0000 0000 0000 2c78 0010
3712120  0002 438a 239c 0000 0016 8ed8 0017 7cbc 0300 7867 0000 3287 0000 000c 0017 7d0c 0017 7d0c 0041 0000 0000 0000 2c78 0010
3712200  0002 438a 239c 0000 0016 8f08 0017 7cec 0400 7867 0000 3287 0000 0010 0017 7d3c 0017 7d3c 0041 0000 0000 0000 2c78 0010
3712260  0002 438a 239c 0000 0016 8f28 0016 8f88 0100 786f 0000 3287 0000 0004 0017 7d6c 0017 7d6c 0041 0000 0000 0000 2c78 0010
```

```
3712340  0002 438a 239c 0000 0016 8f48 0017 7d4c 0200 786f 0300 3287 0000 0008 0017 7d9c 0017 7d9c 0041 0000 0000 0000 2c78 0010
3712420  0002 438a 239c 0000 0016 8f78 0017 7d7c 0300 786f 0000 3287 0000 000c 0017 7dcc 0017 7dcc 0041 0300 0000 0000 2c78 0010
3712500  0002 438a 239c 0000 0016 8f98 0016 8fe4 0200 7877 0000 3287 0000 0009 0017 7dfc 0017 7dfc 0041 0000 0000 0000 2c78 0010
3712560  0002 438a 239c 0000 0016 8fc4 0017 7d4c 0300 7877 0000 3287 0000 000c 0017 7e2c 0017 7e2c 0041 0000 0000 0000 2c78 0010
3712640  0002 439a 239c 0000 0016 8ff4 2b24 7b44 0002 439a 0016 7538 0009 4c4f 4341 5449 4f4e 5300 0006 4f55 5450 5554 0017 7e60
3712720  2aa8 7e58 0016 b264 0016 744c 2aa8 b238 0017 7e50 0016 740c 2aa8 b2b4 0017 7e6c 0016 73cc 0007 4d41 5849 4d55 4d00 7e90
3713000  2aa8 b318 0016 b314 0016 736c 0006 494e 5055 5453 0017 7ea8 2aa8 7ea0 0016 b320 0017 a250 2aa8 b3f8 0016 b3f4 0016 72dc
3713060  2aa8 b410 0017 7eb4 0017 a1d8 2aa8 7ec4 0017 7ec0 0017 a1a8 2aa8 b4c4 0017 7ecc 0016 72ac 2aa8 7edc 0017 7ed8 0016 7274
3713140  0009 4573 7469 6d61 7465 6400 0006 6967 6e6f 7265 0017 7f0d 0008 6765 745f 6461 7461 0014 0009 7265 6164 5f64 6174 6100
3713220  0008 6563 686f 203e 3e20 002c 0008 6465 6275 672e 706c 005c 0008 7265 6164 6669 6c65 0044 0017 8060 0000 002c b288 b66c
3713300  0000 1107 7fff ffff 0018 1774 0200 0db5 0100 15ad 0130 33fd 0000 000b 0000 315f 003a 2f68 6f6d 652f 6f73 6173 312f 612f
3713360  7669 6a61 792f 5648 444c 2f70 6172 7365 722f 7072 6f6c 6f67 2f6e 6577 6e65 772f 7633 2e31 2f63 6d6f 7331 306b 0065 7420
3713440  003d 2f68 6f6d 652f 6f73 6173 312f 612f 7669 6a61 792f 5648 444c 2f70 6172 7365 722f 7072 6f6c 6f67 2f6e 6577 6e65 772f
3713520  7633 2e31 2f63 616f 7331 306b 2e70 6c00 0000 002c 0017 f598 b27c b66c 0000 110a 7fff ffff 0017 ab10 0200 0db5 0200 2f35
3713600  0000 7e77 0000 0413 0000 315f 0000 002c 0017 f5c4 b27c b66c 0000 1110 7fff ffff 0016 4df0 0200 0db5 0200 224d 0000 7e77
3713660  0000 3287 0000 315f 27f0 0012 0016 4e14 4e1c 0000 0000 0007 228c 0000 0017 8130 0000 0090 b27c b66c 0000 110c 0000 110f
3713740  000a d1bd 0200 0db5 0200 270d 0000 7e77 0000 3287 0000 315f 0017 80c4 0000 0038 b130 b66c 0000 110d 0000 1111 0017 80c9
3714020  0200 0db5 0500 1cdd 0000 777f 0000 0013 0000 3287 00c0 bbc3 0000 0413 0000 315f 0017 8130 0000 002c b4f0 b4e4 0000 110c
3714100  7fff ffff 0008 b9dd 0000 0000 0000 0000 0017 8c90 0002 438a 0018 1788 0018 17d8 0018 1800 0018 1818 0018 1838 0018 1878
3714160  0018 1898 0018 18b8 0018 18d8 0018 18f8 0018 1918 0018 1938 0018 1958 0018 1978 0018 1998 0000 0000 0018 1798 0017 abf8
3714240  0000 1e20 6475 6c65 4e61 6d65 2c20 4e61 6d65 292c 0a09 6461 7461 2854 7970 652c 2054 6563 682c 204e 616d 652c 2042 6974
3714320  732c 2044 6174 6129 2c0a 096f 7065 6e28 7275 6e6c 6273 2c20 7772 6974 652c 2053 7472 6561 6d29 2c0a 0966 6f72 6d61 7428
3714400  5374 7265 616d 2c20 2723 212f 6269 6e2f 6373 6820 2d66 7e6e 736f 7572 6365 207e 7e2f 2e6d 6465 7e6e 272c 205b 5d29 2c0a
3714460  0966 6f72 6d61 7428 5374 7265 616d 2c27 6c62 7320 3c3c 2045 4e44 5f44 4154 417e 6e7e 777e 6e7e 777e 6e7e 777e 6e7e 777e
3714540  6e7e 777e 6e7e 6e71 7e6e 717e 5e45 4e44 5f44 4154 417e 6e27 2c0a 0909 4461 7461 292c 0a09 666c 7573 685f 6f75 7470 7574
3714620  2853 7472 6561 6d29 2c20 636c 6f73 6528 5374 7265 616d 292c 0a09 7772 6974 6528 2720 2020 2020 4578 6563 7574 696e 6720
3714700  6c62 732e 2e2e 2729 2c6e 6c2c 0a09 2873 7973 7465 6d28 5b27 6368 6d6f 6420 2b78 2072 756e 6c62 733b 2072 756e 6c62 7320
3714760  313e 202f 6465 762f 6e75 6c6c 2032 3e26 3127 5d29 202d 3e20 7472 7565 3b74 7275 6529 2c0a 0977 7269 7465 2827 2020 2020
3715040  2045 7865 6375 7469 6f6e 2063 6f6d 706c 6574 6564 2e27 292c 6e6c 2c0a 0966 6f72 6d61 7428 2720 2020 2020 7e77 203a 7e6e
3715120  272c 5b54 7970 655d 292c 0a09 6361 6c6c 5f6c 7665 7228 4e61 6d65 292e 0a0a 6461 7461 3128 6164 6465 722c 205b 6361 7272
3715200  795f 7365 6c65 6374 5f61 6464 6572 2c20 6361 7272 795f 5c6f 6f6b 5f61 6865 6164 5f61 6464 6572 2c0a 0920 2020 2020 2063
3715260  6172 7279 5f73 6b69 705f 6164 6465 722c 2072 6970 706c 655f 6164 6465 725d 292e 0a09 0a64 6174 6128 7465 6368 6e6f 6c6f
3715340  6779 2c20 5b63 6f6f 7331 306b 2d30 2c20 6c63 6231 352d 315d 292e 0a0a 6461 7461 2863 6172 7279 5f73 656c 6563 745f 6164
3715420  6465 722c 2054 6563 682c 204e 616d 652c 2042 6974 732c 205b 312c 2031 2c20 5465 6368 2c20 4e61 6d65 2c20 4269 7473 5d29
3715500  2e0a 6461 7461 2863 6172 7279 5f6c 6f6f 6b5f 6168 6561 645f 6164 6465 722c 2054 6563 682c 204e 616d 652c 2042 6974 732c
3715560  205b 312c 2032 2c20 5465 6368 2c20 4e61 6d65 2c20 4269 7473 5d29 2e0a 6461 7461 2863 6172 7279 5f73 6b69 705f 6164 6465
3715640  722c 2054 6563 682c 204e 616d 652c 2042 6974 732c 205b 312c 2033 2c20 5465 6368 2c20 4e61 6d65 2c20 4269 7473 5d29 2e0a
3715720  6461 7461 2872 6970 706c 655f 6164 6465 722c 2054 6563 682c 204e 616d 652c 2042 6974 732c 205b 312c 2034 2c20 5465 6368
3716000  2c20 4e61 6d65 2c20 4269 7473 5d29 2e0a 0017 8495 0000 0007 0300 08af 0000 1ea7 0013 77e1 0017 4301 0200 0ad7 0000 0a87
3716060  0017 84a9 0017 84b9 0017 84a2 0014 3231 0017 84c6 0014 3211 0017 84ce 0014 31f1 0017 84d6 0014 31cd 0017 84de 0014 31ad
3716140  0017 84e6 0014 318d 0017 84ee 0014 316d 0017 84f6 0014 3149 0017 84fe 0014 3129 0017 8506 0014 3109 0017 850e 0014 30e9
3716220  0017 8516 0014 30c5 0017 851e 0014 30a5 0017 8526 0014 3085 0017 852e 0014 3065 0017 8536 0014 3041 0017 853e 0014 3021
3716300  0017 8546 0014 3001 0017 854e 0014 2fe1 0017 8556 0014 2fbd 0017 855e 0014 2f9d 0017 8566 0014 2f7d 0017 856e 0014 2f5d
3716360  0017 8576 0014 2f39 0017 857e 0014 2f19 0017 8586 0014 2ef9 0017 858e 0014 2ed9 0017 8596 0014 2eb5 0017 859e 0014 2e95
3716440  0017 85a6 0014 2e75 0017 85ae 0014 2e55 0017 85b6 0014 2e31 0017 85be 0014 2e11 0017 85c6 0014 2df1 0017 85ce 0014 2dd1
3716520  0017 85d6 0014 2dad 0017 85de 0014 2d8d 0017 85e6 0014 2d6d 0017 85ee 0014 2d4d 0017 85f6 0014 2d29 0017 85fe 0014 2d09
3716600  0017 8606 0014 2ce9 0017 860e 0014 2cc9 0017 8616 0014 2ca5 0017 861e 0014 2c85 0017 8626 0014 2c65 0017 862e 0014 2c45
3716660  0017 8636 0014 2c21 0017 863e 0014 2c01 0017 8646 0014 2be1 0017 864e 0014 2bc1 0017 8656 0014 2b9d 0017 865e 0014 2b7d
3716740  0017 8666 0014 2b5d 0017 866e 0014 2b3d 0017 8676 0014 2b19 0017 867e 0014 2af9 0017 8686 0014 2ad9 0017 868e 0014 2ab9
3717020  0017 8696 0014 2a95 0017 869e 0014 2a75 0017 86a6 0014 2a55 0017 86ae 0014 2a35 0017 86b6 0014 2a11 0017 86be 0014 29f1
3717100  0017 86c6 0014 29d1 0017 86ce 0014 29b1 0017 86d6 0014 298d 0017 86de 0014 296d 0017 86e6 0014 294d 0017 86ee 0014 292d
3717160  0017 86f6 0014 2909 0017 86fe 0014 28e9 0017 8706 0014 28c9 0017 870e 0014 28a9 0017 8716 0014 2885 0017 871e 0014 2865
3717240  0017 8726 0014 2845 0017 872e 0014 2825 0017 8736 0014 2801 0017 873e 0014 27e1 0017 8746 0014 27c1 0017 874e 0014 27a1
3717320  0017 8756 0014 277d 0017 875e 0014 275d 0017 8766 0014 273d 0017 876e 0014 271d 0017 8776 0014 26f9 0017 877e 0014 26d9
3717400  0017 8786 0014 26b9 0017 878e 0014 2695 0017 8796 0014 2671 0017 879e 0014 2651 0017 87a6 0014 3291 0000 0007 0014 32b1
```

```
3717460  0017 87b6 0200 0ddf 0014 32be 0014 3efe 0200 0ddf 0017 8df6 0017 a0b2 0014 32c5 0000 0007 0014 32e5 0017 87de 0014 3309
3717540  0017 87e6 0014 332d 0017 87ee 0014 334d 0017 87f6 0014 336d 0017 87fe 0014 3391 0017 8806 0014 33b1 0017 880e 0014 33d1
3717620  0017 8816 0014 33f1 0017 881e 0014 3415 0017 8826 0014 3435 0017 882e 0014 3455 0017 8836 0014 3475 0017 883e 0014 3499
3717700  0017 8846 0014 34b9 0017 884e 0014 34d9 0017 8856 0014 34f9 0017 885e 0014 351d 0017 8866 0014 353d 0017 886e 0014 355d
3717760  0017 8876 0014 357d 0017 887e 0014 35a1 0017 8886 0014 35c1 0017 888e 0014 35e1 0017 8896 0014 3601 0017 889e 0014 3625
3720040  0017 88a6 0014 3645 0017 88ae 0014 3665 0017 88b6 0014 3685 0017 88be 0014 36a9 0017 88c6 0014 36c9 0017 88ce 0014 36e9
3720120  0017 88d6 0014 3709 0017 88de 0014 372d 0017 88e6 0014 374d 0017 88ee 0014 376d 0017 88f6 0014 3781 0017 88fe 0014 37b1
3720200  0017 8906 0014 37d1 0017 890e 0014 37f1 0017 8916 0014 3811 0017 891e 0014 3835 0017 8926 0014 3855 0017 892e 0014 3875
3720260  0017 8936 0014 3895 0017 893e 0014 38b9 0017 8946 0014 38d9 0017 894e 0014 38f9 0017 8956 0014 3919 0017 895e 0014 393d
3720340  0017 8966 0014 395d 0017 896e 0014 397d 0017 8976 0014 399d 0017 897e 0014 39c1 0017 8986 0014 39e1 0017 898e 0014 3a01
3720420  0017 8996 0014 3a21 0017 899e 0014 3a45 0017 89a6 0014 3a65 0017 89ae 0014 3a85 0017 89b6 0014 3aa5 0017 89be 0014 3ac9
3720500  0017 89c6 0014 3ae9 0017 89ce 0014 3b09 0017 89d6 0014 3b29 0017 89de 0014 3b4d 0017 89e6 0014 3b6d 0017 89ee 0014 3b8d
3720560  0017 89f6 0014 3ba1 0017 89fe 0014 3bd1 0017 8a06 0014 3bf1 0017 8a0e 0014 3c11 0017 8a16 0014 3c31 0017 8a1e 0014 3c55
3720640  0017 8a26 0014 3c75 0017 8a2e 0014 3c95 0017 8a36 0014 3cb5 0017 8a3e 0014 3cd9 0017 8a46 0014 3cf9 0017 8a4e 0014 3d19
3720720  0017 8a56 0014 3d39 0017 8a5e 0014 3d5d 0017 8a66 0014 3d71 0017 8a6e 0014 3d9d 0017 8a76 0014 3dbd 0017 8a7e 0014 3de1
3721000  0017 8a86 0014 3e01 0017 8a8e 0014 3e21 0017 8a96 0014 3e41 0017 8a9e 0014 3e65 0017 8aa6 0014 3e85 0017 8aae 0014 3ea5
3721060  0017 8ab6 0014 3ec5 0017 8abe 0014 3ee5 0017 8ac6 0100 08af 0000 02bf 0200 0ad7 0014 3ed1 0017 8ad5 0017 8add 0000 0007
3721140  0300 08af 0000 1ea7 0013 897d 0017 40bd 0200 0ad7 0000 0a87 0017 8af1 0017 8b01 0017 8aea 0014 3ea5 0017 8b0e 0014 3e85
3721220  0017 8b16 0014 3e65 0017 8b1e 0014 3e41 0017 8b26 0014 3e21 0017 8b2e 0014 3e01 0017 8b36 0014 3de1 0017 8b3e 0014 3dbd
3721300  0017 8b46 0014 3d9d 0017 8b4e 0014 3d7d 0017 8b56 0014 3d5d 0017 8b5e 0014 3d39 0017 8b66 0014 3d19 0017 8b6e 0014 3cf9
3721360  0017 8b76 0014 3cd9 0017 8b7e 0014 3cb5 0017 8b86 0014 3c95 0017 8b8e 0014 3c75 0017 8b96 0014 3c55 0017 8b9e 0014 3c31
3721440  0017 8ba6 0014 3c11 0017 8bae 0014 3bf1 0017 8bb6 0014 3bd1 0017 8bbe 0014 3bad 0017 8bc6 0014 3b8d 0017 8bce 0014 3b6d
3721520  0017 8bd6 0014 3b4d 0017 8bde 0014 3b29 0017 8be6 0014 3b09 0017 8bee 0014 3ae9 0017 8bf6 0014 3ac9 0017 8bfe 0014 3aa5
3721600  0017 8c06 0014 3a85 0017 8c0e 0014 3a65 0017 8c16 0014 3a45 0017 8c1e 0014 3a21 0017 8c26 0014 3a01 0017 8c2e 0014 39e1
3721660  0017 8c36 0014 39c1 0017 8c3e 0014 399d 0017 8c46 0014 397d 0017 8c4e 0014 395d 0017 8c56 0014 393d 0017 8c5e 0014 3919
3721740  0017 8c66 0014 38f9 0017 8c6e 0014 38d9 0017 8c76 0014 38b9 0017 8c7e 0014 3895 0017 8c86 0014 3875 0017 8c8e 0014 3855
3722020  0017 8c96 0014 3835 0017 8c9e 0014 3811 0017 8ca6 0014 37f1 0017 8cae 0014 37d1 0017 8cb6 0014 37b1 0017 8cbe 0014 378d
3722100  0017 8cc6 0014 376d 0017 8cce 0014 374d 0017 8cd6 0014 3721 0017 8cde 0014 3709 0017 8ce6 0014 36e9 0017 8cee 0014 36c9
3722160  0017 8cf6 0014 36a9 0017 8cfe 0014 3685 0017 8d06 0014 3665 0017 8d0e 0014 3645 0017 8d16 0014 3625 0017 8d1e 0014 3601
3722240  0017 8d26 0014 35e1 0017 8d2e 0014 35c1 0017 8d36 0014 35a1 0017 8d3e 0014 357d 0017 8d46 0014 355d 0017 8d4e 0014 353d
3722320  0017 8d56 0014 351d 0017 8d5e 0014 34f9 0017 8d66 0014 34d9 0017 8d6e 0014 34b9 0017 8d76 0014 3499 0017 8d7e 0014 3475
3722400  0017 8d86 0014 3455 0017 8d8e 0014 3435 0017 8d96 0014 3415 0017 8d9e 0014 33f1 0017 8da6 0014 33d1 0017 8dae 0014 33b1
3722460  0017 8db6 0014 3391 0017 8dbe 0014 336d 0017 8dc6 0014 334d 0017 8dce 0014 332d 0017 8dd6 0014 3309 0017 8dde 0014 32e5
3722540  0017 8de6 0014 32c5 0017 8dee 0014 3f05 0000 0007 0014 3f25 0017 8dfe 0200 0ddf 0014 3f32 0014 4b72 0200 0ddf 0017 943e
3722620  0017 a0a2 0014 3f39 0000 0007 0014 3f59 0017 8e26 0014 3f7d 0017 8e2e 0014 3fa1 0017 8e36 0014 3fc1 0017 8e3e 0014 3fe1
3722700  0017 8e46 0014 4005 0017 8e4e 0014 4025 0017 8e56 0014 4045 0017 8e5e 0014 4065 0017 8e66 0014 4089 0017 8e6e 0014 40a9
3722760  0017 8e76 0014 40c9 0017 8e7e 0014 40e9 0017 8e86 0014 410d 0017 8e8e 0014 412d 0017 8e96 0014 414d 0017 8e9e 0014 416d
3723040  0017 8ea6 0014 4191 0017 8eae 0014 41b1 0017 8eb6 0014 41d1 0017 8ebe 0014 41f1 0017 8ec6 0014 4215 0017 8ece 0014 4235
3723120  0017 8ed6 0014 4255 0017 8ede 0014 4275 0017 8ee6 0014 4299 0017 8eee 0014 42b9 0017 8ef6 0014 42d9 0017 8efe 0014 42f9
3723200  0017 8f06 0014 431d 0017 8f0e 0014 433d 0017 8f16 0014 435d 0017 8f1e 0014 437d 0017 8f26 0014 43a1 0017 8f2e 0014 43c1
3723260  0017 8f36 0014 43e1 0017 8f3e 0014 4401 0017 8f46 0014 4425 0017 8f4e 0014 4445 0017 8f56 0014 4465 0017 8f5e 0014 4485
3723340  0017 8f66 0014 44a9 0017 8f6e 0014 44c9 0017 8f76 0014 44e9 0017 8f7e 0014 4509 0017 8f86 0014 452d 0017 8f8e 0014 454d
3723420  0017 8f96 0014 456d 0017 8f9e 0014 458d 0017 8fa6 0014 45b1 0017 8fae 0014 45d1 0017 8fb6 0014 45f1 0017 8fbe 0014 4611
3723500  0017 8fc6 0014 4635 0017 8fce 0014 4655 0017 8fd6 0014 4675 0017 8fde 0014 4695 0017 8fe6 0014 46b9 0017 8fee 0014 46d9
3723560  0017 8ff6 0014 46f9 0017 8ffe 0014 4719 0017 9006 0014 473d 0017 900e 0014 475d 0017 9016 0014 477d 0017 901e 0014 479d
3723640  0017 9026 0014 47c1 0017 902e 0014 47e1 0017 9036 0014 4801 0017 903e 0014 4821 0017 9046 0014 4845 0017 904e 0014 4865
3723720  0017 9056 0014 4885 0017 905e 0014 48a5 0017 9066 0014 48c9 0017 906e 0014 48e9 0017 9076 0014 4909 0017 907e 0014 4929
3724000  0017 9086 0014 494d 0017 908e 0014 496d 0017 9096 0014 498d 0017 909e 0014 49ad 0017 90a6 0014 49d1 0017 90ae 0014 49f1
3724060  0017 90b6 0014 4a11 0017 90be 0014 4a31 0017 90c6 0014 4a55 0017 90ce 0014 4a75 0017 90d6 0014 4a95 0017 90de 0014 4ab5
3724140  0017 90e6 0014 4ad9 0017 90ee 0014 4af9 0017 90f6 0014 4b19 0017 90fe 0014 4b39 0017 9106 0014 4b59 0017 910e 0100 08af
3724220  0000 02bf 0200 0ad7 0014 4b45 0017 911d 0017 9125 0000 0007 0300 08af 0000 1ea7 0013 9b19 0017 3e79 0200 0ad7 0000 0a87
3724300  0017 9139 0017 9149 0017 9132 0014 4b19 0017 9156 0014 4af9 0017 915e 0014 4ad9 0017 9166 0014 4ab5 0017 916e 0014 4a95
3724360  0017 9176 0014 4a75 0017 917e 0014 4a55 0017 9186 0014 4a31 0017 918e 0014 4a11 0017 9196 0014 49f1 0017 919e 0014 49d1
3724440  0017 91a6 0014 49ad 0017 91ae 0014 498d 0017 91b6 0014 496d 0017 91be 0014 494d 0017 91c6 0014 4929 0017 91ce 0014 4909
3724520  0017 91d6 0014 48e9 0017 91de 0014 48c9 0017 91e6 0014 48a5 0017 91ee 0014 4885 0017 91f6 0014 4865 0017 91fe 0014 4845
```

```
3724600 0017 9206 0014 4821 0017 920e 0014 4801 0017 9216 0014 47e1 0017 921e 0014 47c1 0017 9226 0014 479d 0017 922e 0014 477d
3724660 0017 9236 0014 475d 0017 923e 0014 473d 0017 9246 0014 4719 0017 924e 0014 46f9 0017 9256 0014 46d9 0017 925e 0014 46b9
3724740 0017 9266 0014 4695 0017 926e 0014 4675 0017 9276 0014 4655 0017 927e 0014 4635 0017 9286 0014 4611 0017 928e 0014 45f1
3725020 0017 9296 0014 45d1 0017 929e 0014 45b1 0017 92a6 0014 458d 0017 92ae 0014 456d 0017 92b6 0014 454d 0017 92be 0014 452d
3725100 0017 92c6 0014 4509 0017 92ce 0014 44e9 0017 92d6 0014 44c9 0017 92de 0014 44a9 0017 92e6 0014 4485 0017 92ee 0014 4465
3725160 0017 92f6 0014 4445 0017 92fe 0014 4425 0017 9306 0014 4401 0017 930e 0014 43e1 0017 9316 0014 43c1 0017 931e 0014 43a1
3725240 0017 9326 0014 437d 0017 932e 0014 435d 0017 9336 0014 433d 0017 933e 0014 431d 0017 9346 0014 42f9 0017 934e 0014 42d9
3725320 0017 9356 0014 42b9 0017 935e 0014 4299 0017 9366 0014 4275 0017 936e 0014 4255 0017 9376 0014 4235 0017 937e 0014 4215
3725400 0017 9386 0014 41f1 0017 938e 0014 41d1 0017 9396 0014 41b1 0017 939e 0014 4191 0017 93a6 0014 416d 0017 93ae 0014 414d
3725460 0017 93b6 0014 412d 0017 93be 0014 410d 0017 93c6 0014 40e9 0017 93ce 0014 40c9 0017 93d6 0014 40a9 0017 93de 0014 4089
3725540 0017 93e6 0014 4065 0017 93ee 0014 4045 0017 93f6 0014 4025 0017 93fe 0014 4005 0017 9406 0014 3fe1 0017 940e 0014 3fc1
3725620 0017 9416 0014 3fa1 0017 941e 0014 3f7d 0017 9426 0014 3f59 0017 942e 0014 3f39 0017 9436 0014 4b79 0000 0007 0014 4b99
3725700 0017 9446 0200 0ddf 0014 4ba6 0014 57e6 0200 01df 0017 9a86 0017 a092 0014 4bad 0000 0007 0014 4bcd 0017 946e 0014 4bf1
3725760 0017 9476 0014 4c15 0017 947e 0014 4c35 0017 9486 0014 4c55 0017 948e 0014 4c79 0017 9496 0014 4c99 0017 949e 0014 4cb9
3726040 0017 94a6 0014 4cd9 0017 94ae 0014 4cfd 0017 94b6 0014 4d1d 0017 94be 0014 4d3d 0017 94c6 0014 4d5d 0017 94ce 0014 4d81
3726120 0017 94d6 0014 4da1 0017 94de 0014 4dc1 0017 94e6 0014 4de1 0017 94ee 0014 4e05 0017 94f6 0014 4e25 0017 94fe 0014 4e45
3726200 0017 9506 0014 4e65 0017 950e 0014 4ed9 0017 9516 0014 4ea9 0017 951e 0014 4ec9 0017 9526 0014 4ee9 0017 952e 0014 4f0d
3726260 0017 9536 0014 4f2d 0017 953e 0014 4f4d 0017 9546 0014 4f6d 0017 954e 0014 4f91 0017 9556 0014 4fb1 0017 955e 0014 4fd1
3726340 0017 9566 0014 4ff1 0017 956e 0014 5015 0017 9576 0014 5035 0017 957e 0014 5055 0017 9586 0014 5075 0017 958e 0014 5099
3726420 0017 9596 0014 50b9 0017 959e 0014 50d9 0017 95a6 0014 50f9 0017 95ae 0014 511d 0017 95b6 0014 513d 0017 95be 0014 515d
3726500 0017 95c6 0014 517d 0017 95ce 0014 51a1 0017 95d6 0014 51c1 0017 95de 0014 51e1 0017 95e6 0014 5201 0017 95ee 0014 5225
3726560 0017 95f6 0014 5245 0017 95fe 0014 5265 0017 9606 0014 5285 0017 960e 0014 52a9 0017 9616 0014 52c9 0017 961e 0014 52e9
3726640 0017 9626 0014 5309 0017 962e 0014 532d 0017 9636 0014 534d 0017 963e 0014 536d 0017 9646 0014 538d 0017 964e 0014 53b1
3726720 0017 9656 0014 53d1 0017 965e 0014 53f1 0017 9666 0014 5411 0017 966e 0014 5435 0017 9676 0014 5455 0017 967e 0014 5475
3727000 0017 9686 0014 5495 0017 968e 0014 54b9 0017 9696 0014 54d9 0017 969e 0014 54f9 0017 96a6 0014 5519 0017 96ae 0014 553d
3727060 0017 96b6 0014 555d 0017 96be 0014 557d 0017 96c6 0014 559d 0017 96ce 0014 55c1 0017 96d6 0014 55e1 0017 96de 0014 5601
3727140 0017 96e6 0014 5621 0017 96ee 0014 5645 0017 96f6 0014 5665 0017 96fe 0014 5685 0017 9706 0014 56a5 0017 970e 0014 56c9
3727220 0017 9716 0014 56e9 0017 971e 0014 5709 0017 9726 0014 5729 0017 972e 0014 574d 0017 9736 0014 576d 0017 973e 0014 578d
3727300 0017 9746 0014 57ad 0017 974e 0014 57cd 0017 9756 0100 08af 0000 02bf 0200 0ad7 0014 57b9 0017 9765 0017 976d 0000 0007
3727360 0300 08af 0000 1ea7 0013 acb5 0017 3c35 0200 0ad7 0000 0a87 0017 9781 0017 9791 0017 977a 0014 578d 0017 979e 0014 576d
3727440 0017 97a6 0014 574d 0017 97ae 0014 5729 0017 97b6 0014 5709 0017 97be 0014 56e9 0017 97c6 0014 56c9 0017 97ce 0014 56a5
3727520 0017 97d6 0014 5685 0017 97de 0014 5665 0017 97e6 0014 5645 0017 97ee 0014 5621 0017 97f6 0014 5601 0017 97fe 0014 55e1
3727600 0017 9806 0014 55c1 0017 980e 0014 559d 0017 9816 0014 557d 0017 981e 0014 555d 0017 9826 0014 553d 0017 982e 0014 5519
3727660 0017 9836 0014 54f9 0017 983e 0014 54d9 0017 9846 0014 54b9 0017 984e 0014 5495 0017 9856 0014 5475 0017 985e 0014 5455
3727740 0017 9866 0014 5435 0017 986e 0014 5411 0017 9876 0014 53f1 0017 987e 0014 53d1 0017 9886 0014 53b1 0017 988e 0014 538d
3730020 0017 9896 0014 536d 0017 989e 0014 534d 0017 98a6 0014 532d 0017 98ae 0014 5309 0017 98b6 0014 52e9 0017 98be 0014 52c9
3730100 0017 98c6 0014 52a9 0017 98ce 0014 5285 0017 98d6 0014 5265 0017 98de 0014 5245 0017 98e6 0014 5225 0017 98ee 0014 5201
3730160 0017 98f6 0014 51e1 0017 98fe 0014 51c1 0017 9906 0014 51a1 0017 990e 0014 517d 0017 9916 0014 515d 0017 991e 0014 513d
3730240 0017 9926 0014 511d 0017 992e 0014 50f9 0017 9936 0014 50d9 0017 993e 0014 50b9 0017 9946 0014 5099 0017 994e 0014 5075
3730320 0017 9956 0014 5055 0017 995e 0014 5035 0017 9966 0014 5015 0017 996e 0014 4ff1 0017 9976 0014 4fd1 0017 997e 0014 4fb1
3730400 0017 9986 0014 4f91 0017 998e 0014 4f6d 0017 9996 0014 4f4d 0017 999e 0014 4f2d 0017 99a6 0014 4f0d 0017 99ae 0014 4ee9
3730460 0017 99b6 0014 4ec9 0017 99be 0014 4ea9 0017 99c6 0014 4e89 0017 99ce 0014 4e65 0017 99d6 0014 4e45 0017 99de 0014 4e25
3730540 0017 99e6 0014 4e05 0017 99ee 0014 4de1 0017 99f6 0014 4dc1 0017 99fe 0014 4da1 0017 9a06 0014 4d81 0017 9a0e 0014 4d5d
3730620 0017 9a16 0014 4d3d 0017 9a1e 0014 4d1d 0017 9a26 0014 4cfd 0017 9a2e 0014 4cd9 0017 9a36 0014 4cb9 0017 9a3e 0014 4c99
3730700 0017 9a46 0014 4c79 0017 9a4e 0014 4c55 0017 9a56 0014 4c35 0017 9a5e 0014 4c15 0017 9a66 0014 4bf1 0017 9a6e 0014 4bcd
3730760 0017 9a76 0014 4bad 0017 9a7e 0014 57ed 0000 0007 0014 580d 0017 9a8e 0014 582d 0017 9a96 0014 5851 0017 9a9e 0014 5875
3731040 0017 9aa6 0014 5895 0017 9aae 0014 58b5 0017 9ab6 0014 58d9 0017 9abe 0014 58f9 0017 9ac6 0014 5919 0017 9ace 0014 5939
3731120 0017 9ad6 0014 595d 0017 9ade 0014 597d 0017 9ae6 0014 599d 0017 9aee 0014 59bd 0017 9af6 0014 59e1 0017 9afe 0014 5a01
3731200 0017 9b06 0014 5a21 0017 9b0e 0014 5a41 0017 9b16 0014 5a65 0017 9b1e 0014 5a85 0017 9b26 0014 5aa5 0017 9b2e 0014 5ac5
3731260 0017 9b36 0014 5ae9 0017 9b3e 0014 5b09 0017 9b46 0014 5b29 0017 9b4e 0014 5b49 0017 9b56 0014 5b6d 0017 9b5e 0014 5b8d
3731340 0017 9b66 0014 5bad 0017 9b6e 0014 5bcd 0017 9b76 0014 5bf1 0017 9b7e 0014 5c11 0017 9b86 0014 5c31 0017 9b8e 0014 5c51
3731420 0017 9b96 0014 5c75 0017 9b9e 0014 5c95 0017 9ba6 0014 5cb5 0017 9bae 0014 5cd5 0017 9bb6 0014 5cf9 0017 9bbe 0014 5d19
3731500 0017 9bc6 0014 5d39 0017 9bce 0014 5d59 0017 9bd6 0014 5d7d 0017 9bde 0014 5d9d 0017 9be6 0014 5dbd 0017 9bee 0014 5ddd
3731560 0017 9bf6 0014 5e01 0017 9bfe 0014 5e21 0017 9c06 0014 5e41 0017 9c0e 0014 5e61 0017 9c16 0014 5e85 0017 9c1e 0014 5ea5
3731640 0017 9c26 0014 5ec5 0017 9c2e 0014 5ee5 0017 9c36 0014 5f09 0017 9c3e 0014 5f29 0017 9c46 0014 5f49 0017 9c4e 0014 5f69
```

3731720 0017 9c56 0014 5f8d 0017 9c5e 0014 5fad 0017 9c66 0014 5fcd 0017 9c6e 0014 5fed 0017 9c76 0014 6011 0017 9c7e 0014 6031
3732000 0017 9c86 0014 6051 0017 9c8e 0014 6071 0017 9c96 0014 6095 0017 9c9e 0014 60b5 0017 9ca6 0014 60d5 0017 9cae 0014 60f5
3732060 0017 9cb6 0014 6119 0017 9cbe 0014 6139 0017 9cc6 0014 6159 0017 9cce 0014 6179 0017 9cd6 0014 619d 0017 9cde 0014 61bd
3732140 0017 9ce6 0014 61dd 0017 9cee 0014 61fd 0017 9cf6 0014 6221 0017 9cfe 0014 6241 0017 9d06 0014 6261 0017 9d0e 0014 6281
3732220 0017 9d16 0014 62a5 0017 9d1e 0014 62c5 0017 9d26 0014 62e5 0017 9d2e 0014 6305 0017 9d36 0014 6329 0017 9d3e 0014 6349
3732300 0017 9d46 0014 6369 0017 9d4e 0014 6389 0017 9d56 0014 63ad 0017 9d5e 0014 63cd 0017 9d66 0014 63ed 0017 9d6e 0014 640d
3732360 0017 9d76 0300 08af 0000 1ea7 0013 be05 0017 39f1 0200 0ad7 0000 0a87 0017 9d85 0017 9d95 0000 0007 0014 63ed 0017 9da2
3732440 0014 63cd 0017 9daa 0014 63ad 0017 9db2 0014 6389 0017 9dba 0014 6369 0017 9dc2 0014 6349 0017 9dca 0014 6329 0017 9dd2
3732520 0014 6305 0017 9dda 0014 62e5 0017 9de2 0014 62c5 0017 9dea 0014 62a5 0017 9df2 0014 6281 0017 9dfa 0014 6261 0017 9e02
3732600 0014 6241 0017 9e0a 0014 6221 0017 9e12 0014 61fd 0017 9e1a 0014 61dd 0017 9e22 0014 61bd 0017 9e2a 0014 619d 0017 9e32
3732660 0014 6179 0017 9e3a 0014 6159 0017 9e42 0014 6139 0017 9e4a 0014 6119 0017 9e52 0014 60f5 0017 9e5a 0014 60d5 0017 9e62
3732740 0014 60b5 0017 9e6a 0014 6095 0017 9e72 0014 6071 0017 9e7a 0014 6051 0017 9e82 0014 6031 0017 9e8a 0014 6011 0017 9e92
3733020 0014 5fed 0017 9e9a 0014 5fcd 0017 9ea2 0014 5fad 0017 9eaa 0014 5f8d 0017 9eb2 0014 5f69 0017 9eba 0014 5f49 0017 9ec2
3733100 0014 5f29 0017 9eca 0014 5f09 0017 9ed2 0014 5ee5 0017 9eda 0014 5ec5 0017 9ee2 0014 5ea5 0017 9eea 0014 5e85 0017 9ef2
3733160 0014 5e61 0017 9efa 0014 5e41 0017 9f02 0014 5e21 0017 9f0a 0014 5e01 0017 9f12 0014 5ddd 0017 9f1a 0014 5dbd 0017 9f22
3733240 0014 5d9d 0017 9f2a 0014 5d7d 0017 9f32 0014 5d59 0017 9f3a 0014 5d39 0011 3788 0200 7a27 0000 3287 0000 0009 0016 6fcc
3733320 0016 6fcc 0001 007e 0000 0000 0014 7265 6164 5f73 796e 6f70 7379 735f 7265 706f 7274 0051 0011 37c4 0100 7a2f 0000 3287
3733400 0000 0004 0017 9fa4 0017 9fa4 0001 007e 0000 0000 2c78 0018 0002 438a 35c8 41d4 0000 780f 239c 0000 0017 9f5c 2c78 0018
3733460 0002 438a 35c8 41d4 0000 779f 239c 0000 0017 9f5c 0011 3810 0100 7a37 0000 3287 0000 0004 0017 9ff4 0017 9ff4 0001 007e
3733540 0000 0000 2c78 0018 0002 438a 35c8 41d4 0000 7a3f 239c 0000 0017 9f5c 0013 7e1c 0400 7b87 0000 3287 0000 0010 0016 76e8
3733620 0016 76e8 0001 007e 0000 0000 0013 36ec 0200 7a47 0000 3287 0000 0008 0016 7040 0016 7040 0001 007e 0000 0000 0013 370c
3733700 0300 7a4f 0000 3287 0000 000c 0016 70a8 0016 70a8 0001 007e 0000 0000 0013 3418 0300 7a57 0000 3287 0000 000c 0017 7b40
3733760 0017 a3c0 0001 007e 0000 0000 0000 7d27 b328 57ed 0016 4f40 0000 0000 0013 3570 0300 7a5f 0000 3287 0000 000c 0016 718c
3734040 0017 a360 0001 007e 0000 0000 0013 3530 0200 7a67 0000 3287 0000 0008 0016 b73c 0017 a0fc 0001 007e 0000 0000 000c 7379
3734120 6e6f 7073 7973 2e72 7074 0000 28c4 0010 0017 a0fc 52c4 0000 0000 7a6f 2954 0014 0002 438a 5758 5fa0 6750 22bc 0010 abcc
3734200 000c 7265 6d6f 7665 5f66 696c 6573 0000 28c4 e7d9 0017 a360 2ca0 5bd9 0000 000c 0000 0004 0016 71bc 0017 a360 0002 438a
3734260 0017 a220 000d 436f 6d62 696e 6174 696f 6e61 6c00 0010 4e6f 6e63 6f6d 6269 6e61 7469 6f6e 616c 003f 0000 780f 29c8 a179
3734340 0016 b520 0016 7214 0003 4e65 7400 000b 000c 496e 7465 7263 6f6e 6e65 6374 0099 0005 546f 7461 6c00 28c4 0028 0017 a1c8
3734420 4e1c 0000 0000 780f 4e70 0000 0000 7aaf 57b8 4af8 0000 7aaf 55f0 5fa0 5370 2edc 0005 6e65 7473 3a00 28c4 0028 0016 72cc
3734500 4e1c 0000 0000 780f 4e70 0000 0000 7ab7 57b8 4af8 0000 7ab7 55f0 5fa0 5370 2edc 0035 4255 5345 5300 28c4 0028 0017 a240
3734560 4e1c 0000 0000 779f 4e70 0000 0000 7ac7 57b8 4af8 0000 7ac7 55f0 5fa0 5370 2edc 0000 0000 0016 b1a9 0000 0000 0017 a2e9
3734640 000c 4d55 4c54 4950 4c45 5845 5253 0047 28c4 0028 0016 732c 4e1c 0000 0000 779f 4e70 0000 0000 7acf 57b8 4af8 0000 7acf
3734720 55f0 5fa0 5370 2edc 0000 779f 29c8 09af 0017 7ea8 0017 a208 000b 4d55 4c54 4950 4c45 5845 5200 009f 000a 5245 4749 5354
3735000 4552 533a 0000 0b3f 000b 434f 4e4e 4543 5449 4f4e 5300 000f 28c4 0028 0016 738c 4e1c 0000 0000 779f 4e70 0000 0000 7af7
3735060 57b8 4af8 0000 7af7 55f0 5fa0 5370 2edc 0005 4741 5445 5300 0005 5553 4544 3a00 0017 a268 0000 0000 0017 a308 0017 a2e0
3735140 0004 5049 4e53 0047 0003 5045 5200 0b3f 0004 4e45 543a 0013 0000 7a3f 29c8 a2fd 0017 7e78 0016 739c 0005 494e 5055 5400
3735220 000a 2845 5843 4c55 4449 4e47 0017 a331 000d 4249 4449 5245 4354 494f 4e41 4c00 0003 5041 4400 3077 0004 5553 4544 003f
3735300 0003 464f 5200 0013 0005 5049 4e53 3a00 2954 0012 0002 438a 4ec4 0000 0000 7a6f 2edc 0257 000c 7275 6e5f 7379 6e6f 7073
3735360 7973 0000 0017 cd08 0016 6cac 0003 6c62 7300 ab64 28c4 0014 0017 a3c0 4ec4 0000 0000 7a6f 3050 c5a8 0015 6465 7369 676e
3735440 5f73 697a 655f 6672 6f6d 5f64 6174 6100 2954 231f 0002 438a 2ca0 08af 0000 000c 0000 0004 0016 7594 0016 7668 0002 438a
3735520 0017 a454 000e 696e 666f 5f66 726f 6d5f 6461 7461 0000 009f 000f 7379 6e6f 7073 7973 5f72 6570 6f72 7400 2c47 0013 7e5c
3735600 0400 7b8f 0000 3287 0000 0010 0017 a454 0017 a4b4 0001 007e 0000 0000 0016 762c 0000 0000 0016 75a0 0000 0000 0016 75e8
3735660 0017 a434 000a 6473 705f 7265 706f 7274 0000 009f 0000 0000 0017 a43d 0000 0000 0017 a475 000b 6c76 6572 5f72 6570 6f72
3735740 7400 000f 0016 7674 0017 a42c 0000 7cef b328 ab64 0016 41f4 0000 0000 0012 636f 6d62 696e 6174 696f 6e61 6c5f 6172 6561
3736020 0000 1ff7 000b 7265 6164 6669 6c65 2e70 6c00 0000 2cac 3077 0002 438a 2ca0 0b3f 0000 000c 0000 0003 0016 7758 0016 7a28
3736100 0002 438a 0017 a6b4 0015 6e6f 6e63 6f6d 6269 6e61 7469 6f6e 616c 5f61 7265 6100 0000 780f 29c8 00cf 0016 b1e4 0016 7768
3736160 0015 6e65 745f 696e 7465 7263 6f6e 6e65 6374 5f61 7265 6100 000a 746f 7461 6c5f 6172 6561 0000 0b3f 0005 706f 7274 7300
3736240 28c4 0028 0017 a560 4e1c 0000 0000 780f 4e70 0000 0000 7bcf 5818 4af8 0000 7aaf 55f0 6bc8 5370 228c 0004 6e65 7473 002b
3736320 28c4 0028 0016 7820 4e1c 0000 0000 780f 4e70 0000 0000 7bd7 5818 4af8 0000 7ab7 55f0 6bc8 5370 228c 2aa8 0013 0017 a594
3736400 0017 a570 2aa8 08af 0017 a5a0 0016 7830 2b24 3077 0002 438a 0016 7860 0005 6275 7365 7300 28c4 0028 0017 a5f4 4e1c 0000
3736460 0000 779f 4e70 0000 0000 7bdf 5818 4af8 0000 7ac7 55f0 6bc8 5370 228c 0017 a628 0000 0000 000a f30c 0000 0000 0017 a6e8
3736540 0017 a5dc 28c4 0028 0016 7880 4e1c 0000 0000 779f 4e70 0000 0000 76a7 5818 4af8 0000 7acf 55f0 6bc8 5370 228c 2aa8 009f
3736620 0017 a648 0017 a604 0000 779f 29c8 0b3f 0017 a61c 0017 a5c4 000a 6d75 785f 696e 7075 7473 0000 231f 2aa8 a639 0017 a654
3736700 0016 7890 2aa8 a659 0017 a698 0016 78c0 000b 636f 6e6e 6563 7469 6f6e 7300 1ff7 28c4 0028 0016 78e0 4e1c 0000 0000 779f
3736760 4e70 0000 0000 7bef 5818 4af8 0000 7af7 55f0 6bc8 5370 228c 2b24 000f 0002 438a 0017 a680 000a 6761 7465 735f 7573 6564

2001

2002

```
3737040  0017 a6b5 0000 0000 0017 a4f0 0000 0000 0017 a5ed 0014 6176 6572 6167 655f 7069 6e73 5f70 6572 5f6e 6574 00dd 2aa8 3077
3737120  0017 a70c 0016 7920 0000 7a3f 29c8 0013 0017 a6dc 0016 78f0 0010 6d61 785f 7069 6e73 5f70 6572 5f6e 6574 0057 2aa8 a711
3737200  0017 a728 0016 7360 000a 696e 7075 745f 7069 6e73 0000 1ff7 2aa8 0393 0017 a744 0016 79a0 00cb 6f75 7470 7574 5f70 696e
3737260  7300 0b3f 2aa8 2c47 0017 a768 0016 79ec 0012 6269 6469 7265 6374 696f 6e61 6c5f 7069 6e73 0000 0257 2b24 a76d 0002 438a
3737340  0016 7138 b464 0000 0018 1ec8 0000 0000 000f 7379 6e6f 7073 7973 2e73 6372 6970 7400 0000 b464 a7e4 0016 5064 0000 0000
3737420  0010 eb1c 0000 0000 0016 b554 0017 a7a0 b464 a7f0 0016 5134 0000 0000 29cd a7cc 0017 a7ec 0016 58d6 0006 6c62 732e 706c
3737500  0000 0000 29c8 a814 0017 a804 0017 f2aa b464 a7b4 0016 50cc 0000 0000 2b24 a7c0 0002 438a 0017 f202 0008 6361 6c6c 5f6c
3737560  6273 0088 2b24 a7d8 0002 438a 0017 f2be b464 7f30 0016 4fd8 0018 aa68 0016 47cc 0100 7707 0000 3287 0000 0004 0017 a854
3737640  0017 a89c 0001 007c 0000 0000 0003 7d7e 6e00 0000 0004 2c20 7e77 008c 0016 b5a4 000b ae14 27f0 0028 0016 90cc 2ca0 b66c
3737720  0000 0000 0000 0001 0016 6e14 0016 90cc 0002 438a 0017 a878 0016 6e20 0017 a81c 0300 7707 0000 3287 0000 000c 0016 91a8
3740000  0016 91a8 0001 007c 0000 0000 2954 001c 0002 438a 35c8 92a8 9410 3050 4538 6b88 5370 22bc 0017 a82c 2938 0014 0016 9138
3740060  4e1c 0000 0000 0007 3050 c5a8 27f0 a8bd 0016 9138 2ca0 0257 0000 0000 0000 0001 0017 a8b8 0016 9138 0002 438a 0017 a8f0
3740140  0017 a8c4 0017 a97c 0400 7707 0000 3287 0000 0010 0016 921c 0016 921c 0001 007c 0000 0000 2954 001c 0002 438a 362c 92bc
3740220  9410 3050 4538 6bc8 5370 22bc 0016 47dc 001b 6372 6561 7465 5f73 796e 6f70 7379 735f 7363 7269 7074 5f66 696c 6500 1ff7
3740300  0011 4a80 0300 7c3f 0000 3287 0000 000c 0016 9290 0016 9290 0001 007c 0000 0000 0011 4aa0 0100 7c47 0000 3287 0000 0004
3740360  0016 94b4 0016 94b4 0001 007c 0000 0000 0011 4ad4 0100 7c4f 0000 3287 0000 0004 0016 9590 0017 ab94 0001 007c 0000 0000
3740440  0017 a950 0400 7c3f 0000 3287 0000 0010 0017 aa30 0017 aa30 0001 007c 0000 0000 0013 7379 6e6f 7073 7973 5f76 6864 6c5f
3740520  6669 6c65 7300 a9da 0022 636f 6d70 696c 657e 6e72 6570 6f72 7420 2d61 7265 6120 3e20 7e77 7e6e 7175 6974 7e6e 0017 aa02
3740600  0013 e758 0200 7c57 0000 3287 0000 0008 0016 b2e4 0016 9404 0001 007c 0000 0000 2c78 001c 0002 438a 373c 0018 427c 0000
3740660  0000 51e7 239c 0000 0017 aa5c 0017 a9b0 0500 7c3f 0000 3287 0000 0014 0016 9358 0016 9358 0001 007c 0000 0000 001c 636f
3740740  6d70 696c 657e 6e72 6570 6f72 7420 2d61 7265 6120 3e20 7e77 7e6e 0019 0023 7772 6974 6520 2d66 6f72 6d61 7420 7e77 202d
3741020  6f75 7470 7574 207e 777e 6e71 7569 747e 6e00 a7b1 0010 7265 6164 2021 6620 7668 646c 207b 7e77 00ba 001a 2020 2020 2045
3741100  7865 6375 7469 6e67 2053 796e 6f70 7379 732e 2e2e 0017 aaca 0019 2220 313e 2073 796e 6f70 7379 732e 7379 736f 7574 2032
3741160  3e26 3100 0024 2020 2020 2051 796e 6f70 7379 7320 6578 6563 7574 6564 2073 7563 6365 7373 6675 6c6c 792e 00a9 0024 2020
3741240  2020 2053 796e 6f70 7379 7320 7465 726d 696e 6174 6564 2061 626e 6f72 6d61 6c6c 792e 004d 000b 2f62 696e 2f72 6d20 2d66
3741320  2000 a619 000b 7379 6e6f 7073 7973 2e70 5c00 0000 000b 8018 0100 273f 0000 7d07 0000 0004 0016 595c 0016 5998 0001 0080
3741400  0000 0000 2954 0020 0002 438a 4550 6b48 5370 4538 4b8c 0000 0000 7ccf 6bb4 22bc 0015 3d5c 0008 6361 7365 636f 6e76 00c0
3741460  000a 26bc 0000 0000 0005 002c 0017 7ff8 b27c b66c 0000 10eb 7fff ffff 0016 4f3c 0200 0db5 0200 2f35 0000 7cff 0000 040b
3741540  0000 315f 0017 ac64 0000 002c b288 b66c 0000 10ea 7fff ffff 0017 abd0 0200 0db5 0100 15ad 0100 33fd 0000 000b 0000 315f
3741620  0000 002c 0016 41f0 b27c b66c 0000 10f5 7fff ffff 0016 4f94 0200 0db5 0200 224d 0000 7cff 0000 3287 0000 315f 0010 6361
3741700  7272 795f 736b 6970 5f61 6464 6572 0000 0017 ad89 0000 0090 b27c b66c 0000 10ed 0030 10f4 000a d16d 0200 0db5 0200 270d
3741760  0000 7cff 0000 3287 0000 315f 0017 acc8 0000 0038 b27c b66c 0000 10ee 0000 10f6 0017 ad84 0200 0db5 0500 1cdd 0000 7d7f
3742040  0000 000b 0000 3287 00c0 a803 0000 040b 0000 315f 0017 ad80 0000 002c b4f0 b4e4 0000 10ed 7fff ffff 0008 b0dd 0000 0000
3742120  0000 0000 0017 afc4 0002 438a 0018 1510 2c78 008c 0002 438a 45b8 9300 9410 3050 329c 4c70 0000 7d87 3348 4538 4b8c 0000
3742200  0000 02a3 5370 4568 4b8c 0000 0000 029b 6b74 4538 4b8c 0000 0000 0263 6bf4 4568 4b8c 0000 0000 0293 6b74 4538 4b8c 0000
3742260  0000 022b 6bf4 4568 4b8c 0000 0000 02b3 6b74 4538 4b8c 0000 0000 0173 6bf4 4568 6b74 5370 4538 6d0c 6bf4 247c 0015 366c
3742340  0018 3d6c 3d30 2340 0018 1524 0017 ade8 0000 0038 b27c b66c 0000 10ef 0000 10f7 0017 adec 0200 0db5 0500 1cdd 0000 7d7f
3742420  0000 001b 0000 3287 00c0 a923 0000 040b 0000 315f 2c78 0030 0002 438a 45b8 46ec 4768 37f0 3b4c 0000 0018 1560 0018 39f8
3742500  0018 1580 0018 3a4c 0017 9fe4 0014 2330 0018 15a0 0017 aed8 0000 0038 b27c b66c 0000 10f0 0000 10f8 0017 aedc 0200 0db5
3742560  0500 1cdd 0000 718f 0000 0013 0000 3287 00c0 ab03 0000 040b 0000 315f 2c78 008c 0002 438a 45c4 3574 33a0 41e8 0000 3387
3742640  24d0 0000 0008 d3dc 0014 437c 4254 0000 0000 71a7 3b4c 0000 0008 c11c 0014 4568 6d50 5370 4254 0000 0000 7daf 3b4c 0000
3742720  0008 c11c 0014 4568 6d50 5370 4254 0000 0000 7db7 3b4c 0000 0008 c11c 0014 4568 6d50 5370 4254 0000 0000 7dbf 3b4c 0000
3743000  0008 c11c 0010 39a4 0008 c09c 0010 3cf4 242c 0000 0008 b95c 0027 2020 2020 2045 7865 6375 7469 6e67 206c 636f 6d70 2c20
3743060  6c6c 696e 6b20 616e 6420 6c76 6572 2e2e 2e00 726f 0017 afc0 0000 0038 b27c b66c 0000 10f1 0000 10f9 0017 afc4 0200 0db5
3743140  0500 1cdd 0000 7d97 0000 000b 0000 3287 00c0 ac03 0000 040b 0000 315f 2c78 0080 0002 438a 45c4 42ac 0000 7dc7 0008 ec1c
3743220  0014 247c 0008 d13c 0014 2e7c ad64 2ba0 0014 003c 4538 4af8 0000 76c7 5370 4550 6d50 6b74 4538 4af8 0000 0ddf 6bb4 4550
3743300  6d50 6b74 4538 4af8 0000 7dcf 6bb4 247c 0015 3d5c 0010 aa18 2e98 2c98 0004 2c58 4300 0000 0000 7dd7 0008 ec1c 000c 247c
3743360  0008 d13c 000c 234c 0008 d13c 002d 2e7b 4c43 4d50 4c53 542c 4c49 4e4b 4c53 542c 4445 4c43 454c 2c58 4445 4c43 454c 2c53
3743440  494d 2c56 4552 4c53 547d 2030 0017 b030 0000 0038 b130 b66c 0000 10f2 0000 10fa 0017 accd 0200 0db5 0500 1cdd 0000 7d9f
3743520  0000 0013 0000 3287 00c0 ad03 0000 040b 0000 315f 2c78 0038 0002 438a 4580 4af8 0000 7ddf 5370 4568 6b48 6c34 4538 4af8
3743600  0000 5f5f 6bf4 4568 6b88 6b74 4538 4af8 0000 7337 6bf4 22bc 0015 3d5c 0017 cd1c 0000 1ba4 6c6c 2075 7070 6572 2063 6173
3743660  6520 6c65 7474 6572 7320 666f 7263 6564 2074 6f20 6c6f 7765 7220 6361 7365 2c20 6269 6e64 7320 5920 746f 2069 742e 0a20
3743740  2020 2075 7070 6572 2858 2c20 5929 2063 6f6e 7665 7274 7320 5820 746f 2061 2063 6f6e 7374 616e 7420 6f66 2074 6865 2073
3744020  616d 6520 7479 7065 2077 6974 680a 0961 6c6c 206c 6f77 6572 2063 6173 6520 6c65 7474 6572 7320 666f 7263 6564 2074 6f20
3744100  7570 7065 7220 6361 7365 2c20 6269 6e64 7320 5920 746f 2069 742e 0a20 2020 206d 6978 6564 2858 2c20 5929 2063 6f6e 7665
```

```
3744160 7274 7320 5820 746f 2061 2063 6f6e 7374 616e 7420 6f66 2074 6865 2073 6164 6520 7479 7065 2077 6974 680a 0974 6865 2066
3744240 6972 7374 206c 6574 7465 7220 6f66 2065 6163 6820 6772 6f75 7020 6f66 206c 6574 7465 7273 2069 6e20 7570 7065 7220 6361
3744320 7365 2c0a 0973 7562 7365 7175 656e 7420 6c65 7474 6572 7320 6f66 2065 6163 6820 6772 6f75 7020 696e 206c 6f77 6572 2063
3744400 6173 652c 2062 696e 6473 2059 2074 6f20 5974 2e0a 0a20 2020 206c 6f77 6572 2858 2920 6973 2074 7275 6520 7768 656e 2074
3744460 6865 206e 6163 6520 6f66 2058 2068 6173 206e 6f20 7570 7065 7220 6361 7365 206c 6574 7465 7273 2e0a 2020 2020 7570 7065
3744540 7228 5829 2069 7320 7472 7565 2077 6865 6e20 7468 6520 6e61 6d65 206f 6620 5820 6861 7320 6e6f 206c 6f77 6572 2063 6173
3744620 6520 6c65 7474 6572 732e 0a20 2020 206d 6978 6564 2858 2920 6973 2074 7275 6520 7768 656e 2074 6865 206e 616d 6520 6f66
3744700 2058 2068 6173 206c 6574 7465 7273 206f 6620 626f 7468 2063 6173 6573 2e0a 0a20 2020 2041 7320 616e 2065 7874 7261 2d73
3744760 7065 6369 616c 2066 756e 2d74 7970 6520 6e6f 742d 746f 2d62 652d 6964 6974 6174 6564 2068 6163 6b2c 0a20 2020 207b 6c6f
3745040 7765 722c 7570 7065 722c 6d69 7365 647d 2f32 2077 696c 6c20 636f 6e76 6572 7420 6120 2a2a 4e4f 4e2d 454d 5054 592a 2a20
3745120 6c69 7374 0a20 2020 206f 6620 6368 6172 6163 7465 7220 636f 6465 7320 746f 2074 6865 2061 7070 726f 7072 6961 7465 2063
3745200 6173 6520 7061 7474 6572 6e2c 2061 6e64 0a20 2020 207b 6c6f 7765 722c 7570 7065 722c 6d69 7865 647d 2f31 2077 696c 6c20
3745260 6163 6365 7074 2061 202a 2a4e 4f4e 2d45 4d50 5459 2a2a 206c 6973 740a 2020 2020 6f66 2063 6861 7261 6374 6572 2063 6f64
3745340 6573 206f 6620 7468 6520 6170 7072 6f70 7269 6174 6520 6361 7365 2070 6174 7465 726e 2e0a 0a20 2020 204e 6f74 6520 7468
3745420 6520 656d 7068 6173 6973 206f 6e20 2a2a 4e4f 4e2d 454d 5054 592a 2a3a 2020 616e 2065 6d70 7479 206c 6973 7420 6973 2061
3745500 6e20 6174 6f6d 2e0a 2020 2020 496e 206d 6f73 7420 7665 7273 696f 6e73 206f 6620 5175 696e 7475 7320 5072 6f6c 6f67 2c20
3745560 7468 6174 2061 746f 6d20 6973 2073 7065 6c6c 6564 2022 5b5d 222e 0a20 2020 2042 7574 2069 6e20 5365 726f 7820 5175 696e
3745640 7475 7320 5072 6f6c 6f67 2c20 666f 7220 636f 6d70 6174 6962 696c 6974 7920 7769 7468 204c 6973 702c 2074 6865 0a20 2020
3745720 2065 6d70 7479 206c 6973 7420 6973 2073 7065 6c6c 6564 2022 4e49 4c22 2077 6869 6368 2069 7320 7468 7265 6520 7570 7065
3746000 722d 6361 7365 206c 6574 7465 7273 2e0a 0a20 2020 2054 6865 2062 6568 6176 696f 7572 206f 6620 7468 6573 6520 6f70 6572
3746060 6174 696f 6e73 206f 6e20 6e6f 6e2d 6772 6f75 6e64 2061 7267 756d 656e 7473 206f 720a 2020 2020 6172 6775 6d65 6e74 7320
3746140 7768 6963 6820 6172 6520 6c69 7374 7320 6275 7420 7768 6f73 6520 656c 656d 656e 7473 2061 7265 206e 6f74 2061 6c6c 0a20
3746220 2020 2063 6861 7261 6374 6572 2063 6f64 6573 2069 7320 4e4f 5420 4445 4649 4e45 442e 2020 496e 2074 6869 7320 7265 6c65
3746300 6173 652c 206e 6f6e 6520 6f66 0a20 2020 2074 6865 7365 2070 7265 6469 6361 7465 7320 6973 7375 6573 2065 7272 6f72 206d
3746360 6573 7361 6765 7320 696e 2069 7473 206f 776e 206e 616d 652e 0a20 2020 2054 6869 7320 7061 636b 6167 6520 6973 204e 4f54
3746440 2053 5550 504f 5254 4544 2e0a 2a2f 0a0a 0a25 2020 206c 6f77 6572 5f75 7070 6572 283f 4c6f 7765 722c 203f 5570 7065 7229
3746520 0a25 2020 2069 7320 7472 7565 2077 6865 6e20 4c6f 7765 7220 616e 6420 5570 7065 7220 6172 6520 636f 6e73 7461 6e74 7320
3746600 6f66 2074 6865 2073 616d 6520 7479 7065 2028 626f 7468 0a25 2020 2061 746f 6d73 206f 7220 626f 7468 2073 7472 696e 6773
3746660 292c 204c 6f77 6572 2063 6f6e 7461 696e 7320 6e6f 2075 7070 6572 2063 6173 6520 6c65 7474 6572 732c 0a25 2020 2055 7070
3746740 6572 2063 6f6e 7461 696e 7320 6e6f 206c 6f77 6572 2063 6173 6520 6c65 7474 6572 732c 2061 6e64 2077 6865 7265 7665 7220
3747020 6f6e 6520 6f66 2074 6865 6d0a 2520 2020 636f 6e74 6169 6e73 2061 206c 6574 7465 7220 7468 6520 6f74 6865 7220 636f 6e74
3747100 6169 6e73 2074 6865 2073 616d 6520 6c65 7474 6572 2069 6e20 7468 650a 2520 2020 6f70 706f 7369 7465 2063 6173 652e 2020
3747160 5468 6973 2070 7265 6469 6361 7465 2064 6f65 7320 5f6e 6f74 5f20 776f 726b 2077 656c 6c20 7769 7468 206c 616e 6775 6167
3747240 6573 0a25 2020 206c 696b 6520 4765 726d 616e 2077 6865 7265 2074 6865 7265 2061 7265 206c 6f77 6572 2063 6173 6520 6c65
3747320 7474 6572 7320 7768 6963 6820 5f63 616e 6e6f 745f 2062 650a 2520 2020 636f 6e76 6572 7465 6420 746f 2075 7070 6572 2063
3747400 6173 652e 0a0a 6c6f 7765 725f 7570 7065 7228 4c6f 7765 722c 2055 7070 6572 2920 3a2d 0a09 2820 2020 6174 6f6d 284c 6f77
3747460 6572 2920 2d3e 0a09 2020 2020 6174 6f6d 5f63 6861 7273 284c 6f77 6572 2c20 4c6f 7765 7243 6861 7273 292c 0a09 2020 2020
3747540 6c6f 7765 725f 7570 7065 725f 6368 6172 7328 4c6f 7765 7243 6861 7273 2c20 5570 7065 7243 6861 7273 292c 0a09 2020 2020
3747620 6174 6f6d 5f63 6861 7273 2855 7070 6572 2c20 5570 7065 7243 6861 7273 290a 093b 2020 2073 7472 696e 6728 4c6f 7765 7229
3747700 202d 3e0a 0920 2020 2073 7472 696e 675f 6368 6172 7328 4c6f 7765 722c 204c 6f77 6572 4368 6172 7329 2c0a 0920 2020 206c
3747760 6f77 6572 5f75 7070 6572 5f63 6861 7273 284c 6f77 6572 4368 6172 732c 2055 7070 6572 4368 6172 7329 2c0a 0920 2020 2073
3750040 7472 696e 675f 6368 6172 7328 5570 7065 722c 2055 7070 6572 4368 6172 7329 0a09 3b20 2020 6e6f 6e76 6172 284c 6f77 6572
3750120 2920 2d3e 0a09 2020 2020 6661 696c 0909 0925 2074 7970 6520 6661 696c 7572 650a 093b 2020 2061 746f 6d28 5570 7065 7229
3750200 202d 3e0a 0920 2020 2061 746f 6d5f 6368 6172 7328 5570 7065 722c 2055 7070 6572 4368 6172 7329 2c0a 0920 2020 2075 7070
3750260 6572 5f6c 6f77 6572 5f63 6861 7273 284c 6f77 6572 4368 6172 732c 2055 7070 6572 4368 6172 7329 2c0a 0920 2020 2061 746f
3750340 6d5f 6368 6172 7328 4c6f 7765 722c 204c 6f77 6572 4368 6172 7329 0a09 3b20 2020 7374 7269 6e67 2855 7070 6572 2920 2d3e
3750420 0a09 2020 2020 6174 6f6d 5f63 6861 7273 2855 7070 6572 2c20 5570 7065 7243 6861 7273 292c 0a09 2020 2020 7570 7065 725f
3750500 6c6f 7765 725f 6368 6172 7328 4c6f 7765 7243 6861 7273 2c20 5570 7065 7243 6861 7273 292c 0a09 2020 2020 6174 6f6d 5f63
3750560 6861 7273 284c 6f77 6572 2c20 4c6f 7765 7243 6861 7273 290a 093b 2020 206e 6f6e 7661 7228 5570 7065 7229 202d 3e0a 0920
3750640 2020 2066 6169 6c09 0909 2520 7479 7065 2066 6169 6c75 7265 0a09 3b20 2020 0a09 2020 2020 6661 696c 0909 0925 2069 6e73
3750720 7461 6e74 6961 7469 6f6e 2066 6175 6c74 0a09 292e 0a0a 0a6c 6f77 6572 5f75 7070 6572 5f63 6861 7273 285b 5d2c 205b 5d29
3751000 2e0a 6c6f 7765 725f 7570 7065 725f 6368 6172 7328 5b4c 7c4c 735d 2c20 5b55 7c55 735d 2920 3a2d 0a09 2820 2020 6973 5f75
3751060 7070 6572 284c 2920 2d3e 2066 6169 6c0a 093b 2020 2074 6f5f 7570 7065 7228 4c2c 2055 290a 0929 2c0a 096c 6f77 6572 5f75
3751140 7070 6572 5f63 6861 7273 284c 732c 2055 7329 2e0a 0a0a 7570 7065 725f 6c6f 7765 725f 6368 6172 7328 5b5d 2c20 5b5d 292e
3751220 0a75 7070 6572 5f6c 6f77 6572 5f63 6861 7273 285b 557c 5573 5d2c 205b 4c7c 4c73 5d29 203a 2d0a 0928 2020 2069 735f 6c6f
```

```
3751300  7765 7228 4c29 2023 3e20 6661 696c 0a09 3b20 2020 746f 5f6c 6f77 6572 2855 2c20 4c29 0a09 292c 0a09 7570 7065 725f 6c6f
3751360  7765 725f 6368 6172 7328 5573 2c20 4c73 292e 0a0a 0a0a 2520 2020 6c6f 7765 7228 2b54 6578 742c 203f 4c6f 7765 7229 0a25
3751440  2020 2063 6f6e 7665 7274 7320 616e 2061 746f 6d2c 205b 5851 505d 2073 7472 696e 672c 206f 7220 6e6f 6e2d 656d 7074 7920
3751520  6c69 7374 206f 6620 6368 6172 6163 7465 7220 636f 6465 730a 2520 2020 5465 7874 2074 6f20 6c6f 7765 7220 6361 7365 2e20
3751600  204c 6f77 6572 2061 6e64 2054 6578 7420 6172 6520 7468 6520 7361 6d65 2074 7970 6520 6f66 2074 6572 6d2e 0a0a 6c6f 7765
3751660  7228 5465 7874 2c20 4c6f 7765 7229 203a 2d0a 0928 2020 2061 746f 6d28 5465 7874 2920 2d3e 0a09 0961 746f 6d5f 6368 6172
3751740  7328 5465 7874 2c20 5465 7874 4368 6172 7329 2c0a 0909 6c6f 7765 725f 6368 6172 7328 5465 7874 4368 6172 732c 204c 6f77
3752020  6572 4368 6172 7329 2c0a 0909 6174 6f6d 5f63 6861 7273 284c 6f77 6572 2c20 4c6f 7765 7243 6861 7273 290a 093b 2020 2073
3752100  7472 696e 6728 5465 7874 2920 2d3e 0a09 0973 7472 696e 675f 6368 6172 7328 5465 7874 2c20 5465 7874 4368 6172 7329 2c0a
3752160  0909 6c6f 7765 725f 6368 6172 7328 5465 7874 4368 6172 732c 204c 6f77 6572 4368 6172 7329 2c0a 0909 7374 7269 6e67 5f63
3752240  6861 7273 284c 6f77 6572 2c20 4c6f 7765 7243 6861 7273 290a 093b 2020 202f 2a20 6d61 7962 6520 6120 6c69 7374 206f 6620
3752320  6368 6172 6163 7465 7220 636f 6465 7320 2a2f 0a09 096c 6f77 6572 5f63 6861 7273 2854 6578 742c 204c 6f77 6572 290a 0929
3752400  2e0a 0a6c 6f77 6572 5f63 6861 7273 282d 2c20 5f29 203a 2d20 212c 2066 6169 6c2e 0a6c 6f77 6572 5f63 6861 7273 285b 5d2c
3752460  205b 5d29 2e0a 6c6f 7765 725f 6368 6172 7328 5b54 7c54 735d 2c20 5b55 7c55 735d 2920 3a2d 0a09 746f 5f6c 6f77 6572 2854
3752540  2c20 5529 2c0a 096c 6f77 6572 5f63 6861 7273 2854 732c 2055 7329 2e0a 0a0a 0a25 2020 2075 7070 6572 282b 5465 7874 2c20
3752620  3f55 7070 6572 290a 2520 2020 636f 6e76 6572 7473 2961 6e20 6174 6f6d 2c20 5b58 5150 5d20 7374 7269 6e67 2c20 6f72 206e
3752700  6f6e 2d65 6d70 7479 206c 6973 7420 6f66 2063 6861 7261 6374 6572 2063 6f64 6573 0a25 2020 2054 6578 7420 746f 2075 7070
3752760  6572 2063 6173 652e 2020 5570 7065 7220 616e 6420 5465 7874 2061 7265 2074 6865 2073 616d 6520 7479 7065 206f 6620 7465
3753040  726d 2e0a 0a75 7070 6572 2854 6578 742c 2055 7070 6572 2920 3a2d 0a09 2820 2020 6174 6f6d 2854 6578 7429 202d 3e0a 0909
3753120  6174 6f6d 5f63 6861 7273 2854 6578 742c 2054 6578 7443 6861 7273 292c 0a09 0975 7070 6572 5f63 6861 7273 2854 6578 7443
3753200  6961 7273 2c20 5570 7065 7243 6861 7273 292c 0a09 0961 746f 6d5f 6368 6172 7328 5570 7065 722c 2055 7070 6572 4368 6172
3753260  7329 0a09 3b20 2020 7374 7269 6e67 2854 6578 7429 202d 3e0a 0909 7374 7269 6e67 5f63 6861 7273 2854 6578 742c 2054 6578
3753340  7443 6861 7273 292c 0a09 0975 7070 6572 5f63 6861 7273 2854 6578 7443 6861 7273 2c20 5570 7065 7243 6861 7273 292c 0a09
3753420  0973 7472 696e 675f 6368 6172 7328 5570 7065 722c 2055 7070 6572 4368 6172 7329 0a09 3b20 2020 2f2a 206d 6179 6265 2061
3753500  206c 6973 7420 6f66 2063 6861 7261 6374 6572 2063 6f64 6573 202a 2f0a 0909 7570 7065 725f 6368 6172 7328 5465 7874 2c20
3753560  5570 7065 7229 0a09 292e 0a0a 7570 7065 725f 6368 6172 7328 2d2c 205f 2920 3a2d 2021 2c20 6661 696c 2e0a 7570 7065 725f
3753640  6368 6172 7328 5b5d 2c20 5b5d 292e 0a75 7070 6572 5f63 6861 7273 285b 547c 5473 5d2c 205b 557c 5573 5d29 203a 2d0a 0974
3753720  6f5f 7570 7065 7228 542c 2055 292c 0a09 7570 7065 725f 6368 6172 7328 5473 2c20 5573 292e 0a0a 0a0a 2520 2020 6d69 7865
3754000  6428 2b54 6578 742c 203f 4d69 7865 6429 0a25 2020 2063 6f6e 7665 7274 7320 616e 2061 746f 6d2c 205b 5851 505d 2073 7472
3754060  696e 672c 206f 7220 6e6f 6e2d 656d 7074 7920 6c69 7374 206f 6620 6368 6172 6163 7465 7220 636f 6465 730a 2520 2020 5465
3754140  7874 2074 6f20 6d69 7865 6420 6361 7365 2c20 7768 6572 6520 7468 6520 6669 7273 7420 6c65 7474 6572 2069 6e20 6561 6368
3754220  2062 6c6f 636b 206f 6620 6c65 7474 6572 730a 2520 2020 6973 2069 6e20 7570 7065 7220 6361 7365 2061 6e64 2074 6865 2072
3754300  656d 6169 6e69 6e67 206c 6574 7465 7273 2061 7265 2069 6e20 6c6f 7765 7220 6361 7365 2e0a 2520 2020 5465 7874 2061 6e64
3754360  204d 6978 6564 2061 7265 2074 6865 2073 616d 6520 7479 7065 206f 6620 7465 726d 2e0a 0a6d 6978 6564 2854 6578 742c 204d
3754440  6978 6564 2920 3a2d 0a09 2820 2020 6174 6f6d 2854 6578 7429 202d 3e0a 0909 6174 6f6d 5f63 6861 7273 2854 6578 742c 2054
3754520  6578 7443 6861 7273 292c 0a09 096d 6978 6564 5f63 6861 7273 2854 6578 7443 6861 7273 2c20 4d69 7865 6443 6861 7273 2c20
3754600  3029 2c0a 0909 6174 6f6d 5f63 6861 7273 284d 6978 6564 2c20 4d69 7865 6443 6861 7273 290a 093b 2020 2073 7472 696e 6728
3754660  5465 7874 2920 2d3e 0a09 0973 7472 696e 675f 6368 6172 7328 5465 7874 2c20 5465 7874 4368 6172 7329 2c0a 0909 6d69 7865
3754740  645f 6368 6172 7328 5465 7874 4368 6172 732c 204d 6978 6564 4368 6172 732c 2030 292c 0a09 0973 7472 696e 675f 6368 6172
3755020  7328 4d69 7865 642c 204d 6978 6564 4368 6172 7329 0a09 3b20 2020 2f2a 206d 6179 6265 2061 206c 6973 7420 6f66 2063 6861
3755100  7261 6374 6572 2063 6f64 6573 202a 2f0a 0909 6d69 7865 645f 6368 6172 7328 5465 7874 2c20 4d69 7865 642c 2030 290a 0929
3755160  2e0a 0a6d 6978 6564 5f63 6861 7273 282d 2c20 5f2c 205f 2920 3a2d 2021 2c20 6661 696c 2e0a 6d69 7865 645f 6368 6172 7328
3755240  5b5d 2c20 5b5d 2c20 5f29 2e0a 6d69 7865 645f 6368 6172 7328 5b54 7c54 735d 2c20 5b4d 7c4d 735d 2c20 466c 6167 2920 3a2d
3755320  0a09 6973 5f61 6c70 6861 2854 292c 0a09 212c 0a09 2820 2020 466c 6167 203d 3a3d 2030 202d 3e20 746f 5f75 7070 6572 2854
3755400  2c20 4d29 0a09 3b20 2020 2f2a 206e 6f74 2031 7374 202a 2f20 746f 5f6c 6f77 6572 2854 2c20 4d29 0a09 292c 0a09 6d69 7865
3755460  645f 6368 6172 7328 5473 2c20 4173 2c20 3129 2e0a 6d69 7865 645f 6368 6172 7328 5b54 7c54 735d 2c20 5b54 7c4d 735d 2c20
3755540  5f29 203a 2d0a 096d 6978 6564 5f63 6861 7273 2854 732c 204d 732c 2030 292e 0a0a 0a0a 2520 2020 6c6f 7765 7228 2b54 6578
3755620  7429 0a25 2020 2069 7320 7472 7565 2077 6865 6e20 5465 7874 2069 7320 616e 2061 746f 6d2c 205b 5851 505d 2073 7472 696e
3755700  672c 206f 7220 6c69 7374 206f 6620 6368 6172 6163 7465 720a 2520 2020 636f 6465 7320 636f 6e74 6169 6e69 6e67 206e 6f20
3755760  7570 7065 7220 6361 7365 206c 6574 7465 7273 2e0a 0a6c 6f77 6572 2854 6578 7429 203a 2d0a 0961 746f 6d69 6328 5465 7874
3756040  292c 0a09 212c 0a09 5c2b 2028 2073 7472 696e 675f 6368 6172 285f 2c20 5465 7874 2c20 5570 7065 7229 2c20 6973 5f75 7070
3756120  6572 2855 7070 6572 2920 292e 0a6c 6f77 6572 2854 6578 7429 203a 2d0a 095c 2b20 2820 6368 6172 735f 6368 6172 2854 6578
3756200  742c 2055 7070 6572 292c 2069 735f 7570 7065 7228 5570 7065 7229 2029 2e0a 0a0a 0a25 2020 2075 7070 6572 282b 5465 7874
3756260  290a 2520 2020 6973 2074 7275 6520 7768 656e 2054 6578 7420 6973 2061 6e20 6174 6f6d 2c20 5b58 5150 5d20 7374 7269 6e67
3756340  2c20 6f72 206c 6973 7420 6f66 2063 6861 7261 6374 6572 0a25 2020 2063 6f64 6573 2063 6f6e 7461 696e 696e 6720 6e6f 206c
```

```
3756420 5f77 6572 2063 6173 6520 6c65 7474 6572 732e 0a0a 7570 7065 7228 5465 7874 2920 3a2d 0a09 6174 6f6d 6963 2854 6578 7429
3756500 2c0a 0921 2c0a 095c 2b20 2820 7374 7269 6e67 5f63 6861 7228 5f2c 2054 6578 742c 204c 6f77 6572 292c 2069 735f 6c6f 7765
3756560 7228 4c6f 7765 7229 2029 2e0a 7570 7065 7228 5465 7874 2920 3a2d 0a09 5c2b 2028 2063 6861 7273 5f63 6861 7228 5465 7874
3756640 2c20 4c6f 7765 7229 2c20 6973 5f6c 6f77 6572 284c 6f77 6572 2920 292e 0a0a 0a0a 2520 2020 6d69 7865 6428 2b54 6578 7429
3756720 0a25 2020 2069 7320 7472 7565 2077 6865 6e20 5465 7874 2069 7320 616e 2061 746f 6d2c 205b 5851 505d 2073 7472 696e 672c
3757000 206f 7220 6c69 7374 206f 6620 6368 6172 6163 7465 720a 2520 2020 636f 6465 7320 636f 6e74 6169 6e69 6e67 2061 7420 6c65
3757060 6173 7420 6f6e 6520 6c6f 7765 7220 6361 7365 2061 6e64 2061 7420 6c65 6173 7420 6f6e 6520 7570 7065 720a 2520 2020 6361
3757140 7365 206c 6574 7465 722e 0a0a 6d69 7865 6428 5465 7874 2920 3a2d 0a09 6174 6f6d 6963 2854 6578 7429 2c0a 0921 2c0a 0973
3757220 7472 696e 675f 6368 6172 285f 2c20 5465 7874 2c20 4c6f 7765 7229 2c20 6973 5f6c 6f77 6572 284c 6f77 6572 292c 0a09 212c
3757300 0909 2520 636f 6d6d 6974 2074 6f20 6669 7273 7420 6c6f 7765 7220 6361 7365 206c 6574 7465 722e 0a09 7374 7269 6e67 5f63
3757360 6861 7228 5f2c 2054 6578 742c 2055 7070 6572 292c 2069 735f 7570 7065 7228 5570 7065 7229 2c0a 0921 2e09 0925 2063 6f6d
3757440 6d69 7420 746f 2066 6972 7374 2075 7070 6572 2063 6173 6520 6c65 7474 6572 2e0a 6d69 7865 6428 5465 7874 2920 3a2d 0a09
3757520 6368 6172 735f 6368 6172 2854 6578 742c 204c 6f77 6572 292c 2069 735f 6c6f 7765 7228 4c6f 7765 7229 2c0a 0921 2c09 0925
3757600 2063 6f6d 6d69 7420 746f 2066 6972 7374 206c 6f77 6572 2063 6173 6520 6c65 7474 6572 2e0a 0963 6861 7273 5f63 6861 7228
3757660 5465 7374 2c20 5570 7065 7229 2c20 6973 5f75 7070 6572 2855 7070 6572 292c 0a09 212e 0909 2520 636f 6d6d 6974 2074 6f20
3757740 6669 7273 7420 7570 7065 7220 6361 7365 206c 6574 7465 722e 0a0a 0a0a 2525 2020 2063 6861 7273 5f63 6861 7228 2b43 6861
3760020 7273 2c20 2d43 6861 7229 0a25 2020 2020 656e 756d 6572 6174 6573 2065 6c65 6d65 6e74 7320 4368 6172 206f 6620 7468 6520
3760100 6c69 7374 206f 6620 6368 6172 6163 7465 7220 636f 6465 7320 4368 6172 732e 0a25 2020 2020 6966 2043 6861 7273 2069 7320
3760160 6e6f 7420 7072 6f70 6572 2c20 6974 2077 696c 6c20 6576 656e 7475 616c 6c79 2066 6169 6c2e 0a0a 6368 6172 735f 6368 6172
3760240 285b 5d2c 205f 2120 3a2d 2021 2c20 6661 696c 2e0a 6368 6172 735f 6368 6172 285b 4368 6172 7c5f 5d2c 2043 6861 7229 2e0a
3760320 6368 6172 735f 6368 6172 285b 5f7c 4368 6172 735d 2c20 4368 6172 2920 3a2d 0a09 6368 6172 735f 6368 6172 2843 6861 7273
3760400 2c20 4368 6172 292e 0a0a 0a0a 0a00 000f 0000 0013 0100 231f 0017 c999 0200 08af 0000 0257 0017 c9b9 0100 3077 0000 000b
3760460 0200 08af 0000 00cf 0017 c9cd 0100 1ff7 0000 02fb 0200 08af 0000 009f 0017 c9e1 0100 3077 0000 0013 0200 0b3f 0000 2c47
3760540 0000 0013 0200 0b3f 0000 000f 0000 0013 0100 231f 0017 c9f5 0200 08af 0000 0257 0017 ca15 0100 3077 0000 0013 0200 08af
3760620 0000 00cf 0017 ca29 0100 1ff7 0000 036b 0200 08af 0000 009f 0017 ca31 0100 3077 0000 000b 0200 0b3f 0000 2c47 0000 000b
3760700 0200 0b3f 0000 000f 0000 0013 0100 231f 0017 ca51 0200 08af 0000 0257 0017 ca71 0100 3077 0000 000b 0200 08af 0000 00cf
3760760 0017 ca85 0100 1ff7 0000 030b 0200 08af 0000 009f 0017 ca99 0100 3077 0000 0013 0200 0b3f 0000 2c47 0000 0013 0200 0b3f
3761040 0000 000f 0000 0013 0100 231f 0017 caad 0200 08af 0000 0257 0017 cacd 0100 3077 0000 0013 0200 08af 0000 00cf 0017 cae1
3761120 0100 1ff7 0000 0393 0200 08af 0000 009f 0017 caf5 0100 3077 0000 000b 0200 0b3f 0000 2c47 0000 000b 0200 0b3f 0000 000f
3761200 0000 0013 0100 231f 0017 cb09 0200 08af 0000 0257 0017 cb29 0100 3077 0000 000b 0200 08af 0000 00cf 0017 cb3d 0100 1ff7
3761260 0000 033b 0200 08af 0000 009f 0017 cb51 0100 3077 0000 0013 0200 0b3f 0000 2c47 0000 0013 0200 0b3f 0000 000f 0000 0013
3761340 0100 231f 0017 cb65 0200 08af 0000 0257 0017 cb85 0100 3077 0000 0013 0200 08af 0000 00cf 0017 cb99 0100 1ff7 0000 037b
3761420 0200 08af 0000 009f 0017 cbad 0100 3077 0000 000b 0200 0b3f 0000 2c47 0000 000b 0200 0b3f 0000 000f 0000 0013 0100 231f
3761500 0005 6d69 7865 6400 0012 c634 0000 0000 0017 a08c 0017 cbd8 2c78 0010 0002 438a 239c 0000 0017 ab84 0000 7d27 b328 a47c
3761560 0016 4f98 0000 0000 0000 7d07 b328 cc10 0016 5004 0000 0000 0000 273f b464 af5d 0016 5030 0017 a794 0017 ab74 0200 273f
3761640 0000 7d07 0000 0008 0016 55fc 0016 55fc 0001 0080 0000 0000 0011 5630 0100 7d2f 0000 7d07 0000 0004 0016 5aa4 0016 5ae4
3761720 0001 0080 0000 0000 0000 7d2f b464 0b3f 0016 5098 0017 a7e0 0017 cc48 0200 7d2f 0000 7d07 0000 0008 0016 580c 0016 580c
3762000 0001 0080 0000 0000 0015 af28 0100 3267 0000 7d07 0000 0004 0016 5a00 0016 5a3c 0001 0080 0000 0000 0000 3267 b464 ccc1
3762060 0016 5100 0017 a7b0 0017 cc98 0200 3267 0000 7d07 0000 0008 0016 56e4 0016 56e4 0001 0080 0000 0000 000e 8334 0200 7d37
3762140 0000 7d07 0000 0008 0016 53cc 0016 53cc 0001 0080 0000 0000 0000 7d37 b328 03ab 0016 5168 0000 0000 0017 cddc 0000 0058
3762220 b288 b66c 0000 10fb 7fff ffff 0018 160c 0200 0db5 0100 15ad 0100 33fd 0000 000b 0000 315f 0017 cddc 0000 002c b288 b66c
3762300 0000 10fb 7fff ffff 0017 cd20 0200 0db5 0100 15ad 0100 33fd 0000 000b 0000 315f 0037 6c62 7320 3c3c 2045 4e44 5f44 4154
3762360 417e 6e7e 777e 6e7e 777e 6e7e 777e 6e7e 777e 6e7e 777e 6e7e 6e71 7e6e 717e 6e45 4e44 5f44 4154 417e 6e00 7220 0029 6368
3762440 6d6f 6420 2b78 2072 756e 6c62 733b 2072 756e 6c62 7320 313e 202f 6465 762f 6e75 6c6c 2032 3e26 3100 0017 cf34 0000 0064
3762520 b27c b66c 0000 10fc 0000 1103 0017 cf38 0200 0db5 0500 1cdd 0000 7def 0000 0023 0000 3287 00c0 b163 0000 03fb 0000 315f
3762600 0017 cf34 0000 002c b4f0 b4e4 0000 10fb 7fff ffff 0008 b0dd 0000 0000 0000 0000 0017 d028 0002 438a 0018 176c 2c78 00f4
3762660 0002 438a 45c4 4728 0020 3588 47f8 0024 3310 247c 0017 f414 0028 3540 0018 001c 38fc 0024 3844 382c 0020 39f8 0018 164c
3762740 0020 33f4 4254 0000 0000 3387 4300 0000 0000 71ff 0008 d3dc 0020 437c 4254 0000 0000 7da7 3c48 0000 0008 c11c 0020 3eec
3763020 001c 41e8 0000 7e07 3c48 0000 0008 c11c 001c 3aa0 0008 c09c 001c 40a0 0008 b95c 0018 42ac 0000 7e0f 0008 ec1c 0018 247c
3763100 0008 d13c 0018 2e7c adec 2ba0 0018 001c 4538 4af8 0000 7e17 5370 247c 0015 3d5c 0018 aa50 2e98 2c88 0004 2c58 4300 0000
3763160 0000 7dd7 0008 ec1c 0014 247c 0008 d13c 0014 4550 6d50 5370 4300 0000 0000 7e1f 0008 c0fc 0010 3cf4 242c 0000 0018 1500
3763240 0017 cfa0 0000 0038 b27c b66c 0000 10fd 0000 1104 0017 cfa4 0200 0db5 0500 1cdd 0000 7e27 0000 0013 0000 3287 00c0 b503
3763320 0000 03fb 0000 315f 2c78 0034 0002 438a 4e1c 0000 0000 746f 5758 4af8 0000 7e2f 55f0 4af8 0000 7e37 55f0 4af8 0000 7e3f
3763400 55f0 4af8 0000 7e47 5370 228c 0017 d024 0000 0038 b27c b66c 0000 10fe 0000 1105 0017 d028 0200 0db5 0500 1cdd 0000 7df7
3763460 0000 0013 0000 3287 00c0 b723 0000 03fb 0000 315f 2c78 004a 0002 438a 4e1c 0000 0000 7e4f 5758 6160 5d7c 0000 0200 0ad7
```

```
3763540  4b8c 0000 0000 7e57 4b8c 0000 0000 0003 56f8 671c 5370 5aec 0200 0ad7 4b8c 0000 0000 7e5f 4b8c 0000 0000 000b 228c 6520
3763620  0017 d12c 0000 0038 b130 b66c 0000 10ff 0000 1106 0017 ce19 0200 0db5 0500 1cdd 0000 7df7 0000 002b 0000 3287 00c0 b263
3763700  0000 03fb 0000 315f 27f0 0034 0017 d08c 4e1c 0000 0000 7e2f 5878 0018 4b8c 0000 0000 000b 55f0 4af8 0000 000b 55f0 6b88
3763760  55f0 6bc8 55f0 6c08 5370 228c 28c4 0034 0017 d0c0 4e1c 0000 0000 7e37 5878 0018 4b8c 0000 0000 000b 55f0 4af8 0000 0013
3764040  55f0 6b88 55f0 6bc8 55f0 6c08 5370 228c 28c4 0034 0017 d0f4 4e1c 0000 0000 7e3f 5878 0018 4b8c 0000 0000 000b 55f0 4af8
3764120  0000 001b 55f0 6b88 55f0 6bc8 55f0 6c08 5370 228c 2954 0034 0002 438a 4e1c 0000 0000 7e47 5878 0018 4b8c 0000 0000 000b
3764200  55f0 4af8 0000 0023 55f0 6b88 55f0 6bc8 55f0 6c08 5370 228c 0017 f4ec 0000 1bf8 2525 2525 2525 2525 2525 2525 2525 2525
3764260  2525 2525 2525 2525 2525 2525 2525 2525 2525 250a 2525 2525 2043 7265 6174 6520 6120 7363 7269 7074 2066 696c 6520 746f
3764340  2065 7865 6375 7465 206c 636d 702c 206c 6c69 6e6b 2061 6e64 206c 7665 720a 0a63 7265 6174 655f 6c76 6572 5f73 6372 6970
3764420  745f 6669 6c65 284e 6574 4669 6c65 2c20 5363 7269 7074 4669 6c65 2920 3a2d 0a09 6f70 656e 2853 6372 6970 7446 696c 652c
3764500  2077 7269 7465 2c20 5374 7265 616d 292c 0a09 666f 726d 6174 2853 7472 6561 6d2c 2027 2321 2f62 696e 2f63 7368 202d 667e
3764560  6e73 6f75 7263 6520 7e7e 2f2e 6364 657e 6e27 2c20 5b5d 292c 0a09 666f 726d 6174 2853 7472 6561 6d2c 2027 6c63 6d70 2020
3764640  7e77 203a 6e6f 717e 6e27 2c20 5b4e 6574 4669 6c65 5d29 2c0a 0966 6f72 6d61 7428 5374 7265 616d 2c20 276c 6c69 6e6b 207e
3764720  7720 3a6e 6f71 7e6e 272c 205b 4e65 7446 696c 655d 292c 0a09 666f 726d 6174 2853 7472 6561 6d2c 2027 6c76 6572 2020 7e77
3765000  203a 6e6f 717e 6e27 2c20 5b4e 6574 4669 6c65 5d29 2c0a 0966 6c75 7368 5f6f 7574 7075 7428 5374 7265 616d 292c 2063 6c6f
3765060  7365 2853 7472 6561 6d29 2e0a 0a25 2525 2525 2525 2525 2525 2525 2525 2525 2525 2525 2525 2525 2525 2525 2525 2525 2525
3765140  2525 2525 2525 2525 2525 2525 2525 2525 2525 2525 2525 2525 2525 2525 2525 2525 2525 2525 2525 2525 2525 250a 2525 2525
3765220  2045 7865 6375 7465 206c 7665 7220 7363 7269 7074 2066 696c 650a 0a72 756e 5f6c 7665 7228 5363 7269 7074 4669 6c65 2920
3765300  3a2d 0a09 7772 6974 6528 2720 2020 2020 4578 6563 7574 696e 6720 6c63 6f6d 702c 206c 6c69 6e6b 2061 6e64 206c 7665 722e
3765360  2e2e 2729 2c6e 6c2c 0a09 280a 0909 7379 7374 656d 285b 2763 686d 6f64 202b 7820 272c 2053 6372 6970 7446 696c 652c 2027
3765440  3b27 2c0a 0909 0953 6372 6970 7446 696c 652c 2027 2031 3e20 2f64 6576 2f6e 756c 6c20 323e 2631 275d 2920 2d3e 2074 7275
3765520  650a 093b 0a09 0974 7275 650a 0929 2c0a 0977 7269 7465 2827 2020 2020 2045 7865 6375 7469 6f6e 2063 6f6d 706c 6574 6564
3765600  2e27 292c 6e6c 2c6e 6c2e 0a0a 2525 2525 2525 2525 2525 2525 2525 2525 2525 2525 2525 2525 2525 2525 2525 2525 2525 2525
3765660  2525 2525 2525 2525 2525 2525 2525 2525 2525 2525 2525 2525 2525 2525 2525 2525 2525 2525 2525 2525 2525 0a0a 7265 6d6f
3765740  7665 5f6c 7665 725f 6669 6c65 7328 4e65 7446 696c 652c 2053 6372 6970 7446 696c 6529 203a 2d0a 0973 7973 7465 6d28 5b27
3766020  2f62 696e 2f72 6d20 272c 2053 6372 6970 7446 696c 652c 2027 2027 2c0a 0909 4e65 7446 696c 652c 272e 7b4c 434d 504c 5354
3766100  2c4c 494e 4b4c 5354 2c44 454c 4345 4c2c 5844 454c 4345 4c2c 5349 4d2c 5645 524c 5354 7d20 275d 292e 0a09 090a 2525 2525
3766160  2525 2525 2525 2525 2525 2525 2525 2525 2525 2525 2525 2525 2525 2525 2525 2525 2525 2525 2525 2525 2525 2525 2525 2525
3766240  2525 2525 2525 2525 2525 2525 2525 2525 2525 2525 2525 2525 2525 0a65 7373 5f69 7465 6d28 7379 6e6f 7073 7973 2c20 2770
3766320  6f72 7473 3a27 2c20 5b27 706f 7274 733a 272c 205f 5d29 3a2d 2021 2e0a 7072 6f63 6573 735f 6974 656d 2873 796e 6f70 7379
3766400  732c 2027 6e65 7473 3a27 2c20 5b27 6e65 7473 3a27 2c20 5f5d 293a 2d20 212e 0a70 726f 6365 7373 5f69 7465 6d28 7379 6e6f
3766460  7073 7973 2c20 2752 6570 6f72 7427 2c20 5b27 5265 706f 7274 272c 2027 3a27 2c20 5f5d 293a 2d20 212e 0a70 726f 6365 7373
3766540  5f69 7465 6d28 7379 6e6f 7073 7973 2c20 2744 6573 6967 6e27 2c20 5b27 4465 7369 676e 272c 2027 3a27 2c20 5f5d 293a 2d20
3766620  212e 0a0a 2525 0a25 2520 466f 7220 4453 500a 2525 0a70 726f 6365 7373 5f69 7465 6d28 6473 702c 2027 4255 5345 5327 2c20
3766700  5b27 4255 5345 5327 2c20 5f5d 2920 3a2d 2021 2e0a 7072 6f63 6573 735f 6974 656d 2864 7370 2c20 274d 554c 5449 504c 4558
3766760  4552 5327 2c20 5b27 4d55 4c54 4950 4c45 5845 5253 272c 205f 5d29 203a 2d20 212e 0a70 726f 6365 7373 5f69 7465 6d28 6473
3767040  702c 2027 4d55 4c54 4950 4c45 5845 5227 2c20 5b27 4d55 4c54 4950 4c45 5845 5227 2c20 2749 4e50 5554 5327 2c20 5f5d 2920
3767120  3a2d 2021 2e0a 7072 6f63 6573 735f 6974 656d 2864 7370 2c20 2752 4547 4953 5445 5253 3a27 2c20 5b27 5245 4749 5354 4552
3767200  533a 272c 2027 544f 5441 4c27 2c20 5f5d 2920 3a2d 2021 2e0a 7072 6f63 6573 735f 6974 656d 2864 7370 2c20 2743 4f4e 4e45
3767260  4354 494f 4e53 272c 205b 2743 4f4e 4e45 4354 494f 4e53 272c 205f 5d29 203a 2d20 212e 0a0a 2525 0a25 2520 466f 7220 6c76
3767340  6572 0a25 250a 7072 6f63 6573 735f 6974 656d 286c 7665 722c 2027 4741 5445 5327 2c20 5b27 4741 5445 5327 2c20 2755 5345
3767420  443a 272c 205f 5d29 2e0a 7072 6f63 6573 735f 6974 656d 286c 7665 722c 2027 4d41 5849 4d55 4d27 2c20 5b27 4d41 5849 4d55
3767500  4d27 2c20 2750 494e 5327 2c20 2750 4552 272c 2027 4e45 543a 272c 205f 5d29 2e0a 7072 6f63 6573 735f 6974 656d 286c 7665
3767560  722c 2027 4156 4552 4147 4527 2c20 5b27 4156 4552 4147 4527 2c20 2750 494e 5327 2c20 2750 4552 272c 2027 4e45 543a 272c
3767640  205f 5d29 2e0a 7072 6f63 6573 735f 6974 656d 286c 7665 722c 2027 494e 5055 5427 2c20 5b27 494e 5055 5427 2c20 2750 494e
3767720  5327 2c20 2728 4558 434c 5544 494e 4727 2c20 2742 4944 4952 4543 5449 4f4e 414c 272c 0a20 2020 2020 2020 2020 2020 2020
3770000  2020 2020 2020 2020 2020 2020 2020 2020 2750 494e 5329 3a27 2c20 5f2c 205f 5d29 2e0a 7072 6f63 6573 735f 6974 656d 286c
3770060  7665 722c 2027 4f55 5450 5554 272c 205b 274f 5554 5055 5427 2c20 2750 494e 5327 2c20 2728 4558 434c 5544 494e 4727 2c20
3770140  2742 4944 4952 4543 5449 4f4e 414c 272c 0a20 2020 2020 2020 2020 2020 2020 2020 2020 2020 2020 2020 2020 2020 2020 2027
3770220  5049 4e53 293a 272c 205f 2c20 5f5d 292e 0a70 726f 6365 7373 5f69 7465 6d28 6c76 6572 2c20 2750 4144 272c 205b 2750 4144
3770300  272c 2027 4c4f 4341 5449 4f4e 5327 2c20 2755 5345 4427 2c20 2746 4f52 272c 0a09 2020 2020 2020 2020 2020 2020 2020 2020
3770360  2020 2027 4249 4449 5245 4354 494f 4e41 4c27 2c20 2750 494e 533a 272c 205f 2c20 5f5d 292e 0a70 726f 6365 7373 5f69 7465
3770440  6d28 6c76 6572 2c20 2742 4944 4952 4543 5449 4f4e 414c 272c 205b 2742 4944 4952 4543 5449 4f4e 414c 272c 2027 5049 4e53
3770520  3a27 2c20 5f2c 205f 5d29 2e0a 0a25 250a 2525 2049 676e 6f72 6520 7265 7374 0a25 250a 7072 6f63 6573 735f 6974 656d 285f
3770600  2c20 5f2c 2063 676e 6f72 6529 3a2d 2021 2e09 0909 2520 6967 6e6f 7265 2072 6573 740a 0a25 2525 2525 2525 2525 2525 2525
```

```
3770660 2525 2525 2525 2525 2525 2525 2525 2525 2525 2525 2525 2525 2525 2525 2525 2525 2525 2525 2525 2525 2525 2525 2525 2525
3770740 2525 2525 2525 2525 2525 2525 2525 2525 250a 2525 2054 6865 2066 6f6c 6c6f 7769 6e67 2070 7265 6469 6361 7465 7320 7370
3771020 6563 6966 7920 686f 7720 746f 2069 6e74 6572 7372 6574 2074 6865 7365 206c 696e 6573 2e0a 2525 0a25 2520 436f 6d6d 6f6e
3771100 2066 6f72 2061 6c6c 0a25 250a 7072 6f63 6573 735f 6461 7461 285f 2c20 5f2c 205b 5d29 2e09 0909 2520 646f 6e65 2077 6974
3771160 6820 7468 6520 6669 6c65 210a 7072 6f63 6573 735f 6461 7461 285f 2c20 5f2c 2069 676e 6f72 6529 203a 2d20 2020 2020 2020
3771240 2020 2020 2520 6967 6e6f 7265 2074 6869 7320 7069 6563 6520 6f66 2064 6174 610a 0921 2c66 6169 6c2e 0a25 250a 2525 2046
3771320 6f72 2043 6869 7073 697a 6572 0a25 250a 7072 6f63 6573 735f 6461 7461 2863 6869 7073 697a 6572 2c20 5f2c 2044 6174 6129
3771400 203a 2d0a 0964 6573 6967 6e5f 7369 7a65 5f66 726f 6d5f 6461 7461 2853 697a 6558 2c20 5369 7a65 592c 2055 6e69 7473 2c20
3771460 4461 7461 292c 0a09 7075 7464 625f 6375 7272 656e 7428 6368 6970 7369 7a65 725f 7265 706f 7274 2c20 5b53 6973 6558 2c20
3771540 5369 7a65 592c 2055 6e69 7473 5d29 2c0a 0921 2c66 6169 6c2e 0a25 250a 2525 2046 6f72 2053 796e 6f70 7379 730a 2525 0a70
3771620 726f 6365 7373 5f64 6174 6128 7379 6e6f 7073 7973 2c20 5f2c 2044 6174 6129 203a 2d0a 0969 6e66 6f5f 6672 6f6d 5f64 6174
3771700 6128 7379 6e6f 7073 7973 2c20 5479 7065 2c20 5661 6c75 652c 2044 6174 6129 2c0a 0970 7574 6462 5f63 7572 7265 6e74 2873
3771760 796e 6f70 7379 735f 7265 706f 7274 2c20 5b54 7970 652c 2056 616c 7565 5d29 2c0a 0921 2c66 6169 6c2e 0a25 250a 2525 2046
3772040 6f72 2044 5350 0a25 250a 7072 6f63 6573 735f 6461 7461 2864 7370 2c20 5f2c 2044 6174 6129 203a 2d0a 0969 6e66 6f5f 6672
3772120 6f6d 5f64 6174 6128 6473 702c 2054 7970 652c 204e 756d 6265 722c 2044 6174 6129 2c0a 096e 756d 6265 7228 4e75 6d62 6572
3772200 292c 0a09 7075 7464 625f 6375 7272 656e 7428 6473 705f 7265 706f 7274 2c20 5b54 7970 652c 204e 756d 6265 725d 292c 0a09
3772260 212c 6661 696c 2e0a 2525 0a25 2520 466f 7220 6c76 6572 0a25 2520 0a70 726f 6365 7373 5f64 6174 6128 6c76 6572 2c20 5f2c
3772340 2044 6174 6129 203a 2d0a 0969 6e66 6f5f 6672 6f6d 5f64 6174 6128 6c76 6572 2c20 5479 7065 2c20 4e75 6d62 6572 2c20 4461
3772420 7461 292c 0a09 6e75 6d62 6572 284e 756d 6265 7229 2c0a 0970 7574 6462 5f63 7572 7265 6e74 286c 7665 725f 7265 706f 7274
3772500 2c20 5b54 7970 652c 204e 756d 6265 725d 292c 0a09 212c 6661 696c 2e0a 0a25 250a 2525 2047 656e 6572 6963 0a25 2520 0a25
3772560 7072 6f63 6573 735f 6461 7461 2850 726f 6772 616d 2c20 5f2c 2044 6174 6129 203a 2d0a 2509 7075 7464 625f 6375 7272 656e
3772640 7428 5072 6f67 7261 6d2c 2044 6174 6129 2c0a 2509 212c 6661 696c 2e0a 0a25 2525 2525 2525 2525 2525 2525 2525 2525 2525
3772720 2525 2525 2525 2525 2525 2525 2525 2525 2525 2525 2525 2525 2525 2525 2525 2525 2525 2525 2525 2525 2525 2525 2525 2525
3773000 2525 2525 2525 2525 2525 250a 2525 2525 2041 7578 696c 6c69 6172 7920 7072 6564 6963 6174 6573 2064 6566 696e 6564 2066
3773060 6f72 2063 6f6e 7665 6e69 656e 6365 2e0a 0a25 2525 2520 666f 7220 6368 6970 7369 7a65 720a 6465 7369 676e 5f73 697a 655f
3773140 6672 6f6d 5f64 6174 6128 5369 7a65 582c 2053 697a 6559 2c20 556e 6974 732c 0a09 0920 2020 2020 205b 2745 7374 696d 6174
3773220 6564 272c 6675 6e63 7469 6f6e 2c73 697a 652c 5369 7a65 582c 556e 6974 732c 5f2c 5369 7a65 592c 5f5d 292e 0a0a 2525 2525
3773300 2066 6f72 2073 796e 6f70 7379 730a 696e 666f 5f66 726f 6d5f 6461 7461 2873 796e 6f70 7379 732c 2063 6f6d 6269 6e61 7469
3773360 6f6e 616c 5f61 7265 612c 2041 7265 612c 205b 2743 6f6d 6269 6e61 7469 6f6e 616c 272c 2027 6172 6561 3a27 2c20 4172 6561
3773440 5d29 2e0a 696e 666f 5f66 726f 6d5f 6461 7461 2873 796e 6f70 7379 732c 206e 6f6e 636f 6d62 696e 6174 696f 6e61 6c5f 6172
3773520 6561 2c41 7265 612c 5b27 4e6f 6e63 6f6d 6269 6e61 7469 6f6e 616c 272c 2761 7265 613a 272c 2041 7265 615d 292e 0a69 6e66
3773600 6f5f 6672 6f6d 5f64 6174 6128 7379 6e6f 7073 7373 2c20 6e65 745f 696e 7465 7263 6f6e 6e65 6374 5f61 7265 612c 4172 6561
3773660 2c5b 274e 6574 272c 2749 6e74 6572 636f 6e6e 6563 7427 2c27 6172 6561 3a27 2c41 7265 615d 292e 0a69 6e66 6f5f 6672 6f6d
3773740 5f64 6174 6128 7379 6e6f 7073 7973 2c20 746f 7461 6c5f 6172 6561 2c20 4172 6561 2c20 5b27 546f 7461 6c27 2c20 2761 7265
3774020 613a 272c 2041 7265 615d 292e 0a69 6e66 6f5f 6672 6f6d 5f64 6174 6128 7379 6e6f 7073 7973 2c20 706f 7274 732c 204e 756d
3774100 6265 722c 205b 2770 6f72 7473 3a27 2c20 4e75 6d62 6572 5d29 2e0a 696e 666f 5f66 726f 6d5f 6461 7461 2873 796e 6f70 7379
3774160 732c 206e 6574 732c 204e 7561 6265 722c 205b 276e 6574 733a 272c 204e 756d 6265 725d 292e 0a69 6e66 6f5f 6672 6f6d 5f64
3774240 6174 6128 7379 6e6f 7073 7973 2c20 7265 706f 7274 2c20 5479 7065 2c20 5b27 5265 706f 7274 272c 2027 3a27 2c20 5479 7065
3774320 5d29 2e0a 696e 666f 5f66 726f 615f 6461 7461 2873 796e 6f70 7379 732c 2064 6573 6967 6e2c 204e 616d 652c 205b 2744 6573
3774400 6967 6e27 2c20 273a 272c 204e 616d 655d 292e 0a0a 2525 2525 2066 6f72 2064 7370 0a69 6e66 6f5f 6672 6f6d 5f64 6174 6128
3774460 6473 702c 2062 7573 6573 2c20 4e75 6d62 6572 2c20 5b27 4255 5345 5327 2c20 4e75 6d62 6572 5d29 2e0a 696e 666f 5f66 726f
3774540 6d5f 6461 7461 2864 7370 2c20 6175 7865 732c 204e 756d 6265 722c 205b 274d 554c 5449 504c 4558 4552 5327 2c20 4e75 6d62
3774620 6572 5d29 2e0a 696e 666f 5f66 726f 6d5f 6461 7461 2864 7370 2c20 6d75 785f 696e 7075 7473 2c20 4e75 6d62 6572 2c20 5b27
3774700 4355 4c54 4950 4c45 5845 5227 2c20 2749 4e50 5554 5327 2c20 4e75 6d62 6572 5d29 2e0a 696e 666f 5f66 726f 6d5f 6461 7461
3774760 2864 7370 2c20 7265 6769 7374 6572 732c 204e 756d 6265 722c 205b 2752 4547 4953 5445 5253 3a27 2c20 2754 4f54 414c 272c
3775040 204e 756d 6265 725d 292e 0a69 6e66 6f5f 6672 6f6d 5f64 6174 6128 6473 702c 2063 6f6e 6e65 6374 696f 6e73 2c20 4e75 6d62
3775120 6572 2c20 5b27 434f 4e4e 4543 5449 4f4e 5327 2c20 4e75 6d62 6572 5d29 2e0a 0a25 2525 2520 666f 7220 6c76 6572 0a69 6e66
3775200 6f5f 6672 6f6d 5f64 6174 6128 6c76 6572 2c20 6761 7465 735f 7573 6564 2c20 4e75 6d62 6572 2c20 5b27 4741 5445 5327 2c20
3775260 2755 5345 443a 272c 204e 756d 6265 725d 292e 0a69 6e66 6f5f 6672 6f6d 5f64 6174 6128 6c76 6572 2c20 6176 6572 6167 655f
3775340 7069 6e73 5f70 6572 5f6e 6574 2c20 4e75 6d62 6572 2c0a 095b 2741 5645 5241 4745 272c 2027 5049 4e53 272c 2027 5045 5227
3775420 2c20 274e 4554 3a27 2c20 4e75 6d62 6572 5d29 2e0a 696e 666f 5f66 726f 6d5f 6461 7461 286c 7665 722c 206d 6178 5f70 696e
3775500 735f 7065 725f 6e65 742c 204e 756d 6265 722c 0a09 5b27 4d41 5849 4d55 4d27 2c20 2750 494e 5327 2c20 2750 4552 272c 2027
3775560 4e45 543a 272c 204e 756d 6265 725d 292e 0a69 6e66 6f5f 6672 6f6d 5f64 6174 6128 6c76 6572 2c20 696e 7075 745f 7069 6e73
3775640 2c20 4e75 6d62 6572 2c0a 095b 2749 4e50 5554 272c 2027 5049 4e53 272c 2027 2845 5843 4c55 4449 4e47 272c 2742 4944 4952
3775720 4543 5449 4f4e 414c 272c 2750 494e 5329 3a27 2c5f 2c4e 756d 6265 725d 292e 0a69 6e66 6f5f 6672 6f6d 5f64 6174 6128 6c76
```

```
3776000  6572 2c20 6f75 7470 7574 5f70 696e 732c 204e 756d 6265 722c 0a09 5b27 4f55 5450 5554 272c 2027 5049 4e53 272c 2027 2845
3776060  5843 4c55 4449 4e47 272c 2742 4944 4952 4543 5449 4f4e 414c 272c 2750 494e 5329 3a27 2c5f 2c4e 756d 6265 725d 292e 0a69
3776140  6e66 6f5f 6672 6f6d 5f64 6174 6128 6c76 6572 2c20 6269 6469 7265 6374 696f 6e61 6c5f 7069 6e73 2c20 4e75 6d62 6572 2c0a
3776220  095b 2742 4944 4952 4543 5449 4f4e 414c 272c 2027 5049 4e53 3a27 2c20 5f2c 204e 756d 6265 725d 292e 0a25 696e 666f 5f66
3776300  726f 6d5f 6461 7461 286c 7665 722c 2070 6164 5f6c 6f63 6174 696f 6e73 2c20 4e75 6d62 6572 2c0a 2509 5b27 5041 4427 2c27
3776360  4c4f 4341 5449 4f4e 5327 2c27 5553 4544 272c 2746 4f52 272c 2742 4944 4952 4543 5449 4f4e 414c 272c 2750 494e 533a 272c
3776440  205f 2c20 4e75 6d62 6572 5d29 2e0a 2525 2525 2525 2525 2525 2525 2525 2525 2525 2525 2525 2525 2525 2525 2525 2525 2525
3776520  2525 2525 2525 2525 2525 2525 2525 2525 2525 2525 2525 2525 2525 2525 2525 2525 2525 2525 2525 2525 2525 2525 0a17 e3d5
3776600  0017 e606 0017 e3c1 0017 e60e 0017 e3ad 0017 e616 0017 e3ad 0017 e616 0017 e3ad 0017 e616 0017 e379 0017 e62c 0017 e365
3776660  0017 e636 0017 e351 0017 e63e 0017 e351 0017 e63e 0017 e351 0017 e63e 0017 e31d 0017 e656 0017 e309 0017 e65e 0017 e2f5
3776740  0017 e666 0017 e2f5 0017 e666 0017 e2f5 0017 e666 0017 e2c1 0017 e67e 0017 e2ad 0017 e686 0017 e299 0017 e68e 0017 e299
3777020  0017 e68e 0017 e299 0017 e68e 0017 e265 0017 e6a6 0017 e251 0017 e6ae 0017 e23d 0017 e6b6 0017 e23d 0017 e6b6 0017 e23d
3777100  0017 e6b6 0017 e209 0017 e6ce 0017 e1f5 0017 e6d6 0017 e1e1 0017 e6de 0017 e1e1 0017 e6de 0017 e1e1 0017 e6de 0017 e1ad
3777160  0017 e6f6 0017 e199 0017 e6fe 0017 e185 0017 e706 0017 e185 0017 e706 0017 e185 0017 e706 0017 e151 0017 e71e 0017 e13d
3777240  0017 e726 0017 e129 0017 e72e 0017 e129 0017 e72e 0017 e129 0017 e72e 0017 e0f5 0017 e746 0017 e0e1 0017 e74e 0017 e0cd
3777320  0017 e756 0017 e0cd 0017 e756 0017 e0cd 0017 e756 0017 e099 0017 e76e 0017 e085 0017 e776 0017 e071 0017 e77e 0017 e071
3777400  0017 e77e 0017 e071 0017 e77e 0017 e03d 0017 e796 0017 e029 0017 e79e 0017 e015 0017 e7a6 0017 e015 0017 e7a6 0017 e015
3777460  0017 e7a6 0017 dfe1 0017 e7be 0017 dfcd 0017 e7c6 0017 dfb9 0017 e7ce 0017 dfb9 0017 e7ce 0017 dfb9 0017 e7ce 0017 df85
3777540  0017 e7e6 0017 df71 0017 e7ee 0017 df5d 0017 e7f6 0017 df5d 0017 e7f6 0017 df5d 0017 e7f6 0017 df29 0017 e80e 0017 df15
3777620  0017 e816 0017 df01 0017 e81e 0017 df01 0017 e81e 0017 df01 0017 e81e 0017 decd 0017 e836 0017 deb9 0017 e83e 0017 dea5
3777700  0017 e846 0017 dea5 0017 e846 0017 dea5 0017 e846 0017 de71 0017 e85e 0017 de5d 0017 e866 0017 de49 0017 e86e 0017 de49
3777760  0017 e86e 0017 de49 0017 e86e 0017 de15 0017 e886 0017 de01 0017 e88e 0017 dded 0017 e896 0017 dded 0017 e896 0017 dded
4000040  0017 e896 0017 d1c5 0017 e8ae 0017 ddb1 0017 e8b6 0017 dd9d 0017 e8be 0017 e8d5 0017 e8c6 0100 08af 0000 0697 0017 e8d5
4000120  0017 e8c6 0013 6571 0017 e8de 0017 e8f5 0017 e8de 0400 08af 0000 0657 0017 dd75 0013 6581 0017 4761 0017 e8f5 0017 e8de
4000200  0017 dd3d 0017 e90a 0013 6511 0017 e912 0013 53ad 0017 e91a 0300 08af 0000 022f 0017 e939 0017 e941 0100 3077 0000 0013
4000260  0100 2b37 0000 0013 0300 08af 0000 022f 0017 e959 0017 e961 0100 3077 0000 000b 0100 2b37 0000 000b 0200 0b3f 0000 2c47
4000340  0000 0013 0200 0b3f 0000 000f 0000 0013 0100 231f 0017 e975 0200 08af 0000 0257 0017 e995 0100 3077 0000 0013 0200 08af
4000420  0000 00cf 0017 e9a9 0100 1ff7 0000 0373 0100 08af 0000 00af 0200 0b3f 0000 2c47 0000 000b 0200 0b3f 0000 000f 0000 0013
4000500  0100 231f 0017 e9c5 0200 08af 0000 0257 0017 e9e5 0100 3077 0000 000b 0200 08af 0000 00cf 0017 e9f9 0100 1ff7 0000 037b
4000560  0200 08af 0000 009f 0017 ea0d 0100 3077 0000 0013 0200 0b3f 0000 2c47 0000 0013 0200 0b3f 0000 000f 0000 0013 0100 231f
4000640  0017 ea21 0200 08af 0000 0257 0017 ea41 0100 3077 0000 0013 0200 08af 0000 00cf 0017 ea55 0100 1ff7 0000 034b 0200 08af
4000720  0000 009f 0017 ea69 0100 3077 0000 000b 0200 0b3f 0000 2c47 0000 000b 0200 0b3f 0000 000f 0000 0013 0100 231f 0017 ea7d
4001000  0200 08af 0000 0257 0017 ea9d 0100 3077 0000 000b 0200 08af 0000 00cf 0017 eab1 0100 1ff7 0000 03a3 0200 08af 0000 009f
4001060  0017 eac5 0100 3077 0000 0013 0200 0b3f 0000 2c47 0000 0013 0200 0b3f 0000 000f 0000 0013 0100 231f 0017 ead9 0200 08af
4001140  0000 0257 0017 eaf9 0100 3077 0000 0013 0200 08af 0000 00cf 0017 eb0d 0100 1ff7 0000 030b 0200 08af 0000 009f 0017 eb21
4001220  0100 3077 0000 000b 0200 0b3f 0000 2c47 0000 000b 0200 0b3f 0000 000f 0000 0013 0100 231f 0017 eb35 0200 08af 0000 0257
4001300  0017 eb55 0100 3077 0000 000b 0200 08af 0000 00cf 0017 eb69 0100 1ff7 0000 0393 0200 08af 0000 009f 0017 eb7d 0100 3077
4001360  0000 0013 0200 0b3f 0000 2c47 0000 0013 0200 0b3f 0000 000f 0000 0013 0100 231f 0017 eb91 0200 08af 0000 0257 0017 ebb1
4001440  0100 3077 0000 0013 0200 08af 0000 00cf 0017 ebc5 0100 1ff7 0000 030b 0200 08af 0000 009f 0017 ebd9 0100 3077 0000 000b
4001520  0200 0b3f 0000 2c47 0000 000b 0200 0b3f 0000 000f 0000 0013 0100 231f 0017 ebed 0200 08af 0000 0257 0017 ec0d 0100 3077
4001600  0000 000b 0200 08af 0000 00cf 0017 ec21 0100 1ff7 0000 0363 0200 08af 0000 009f 0017 ec35 0100 3077 0000 0013 0200 0b3f
4001660  0000 2c47 0000 0013 0200 0b3f 0000 000f 0000 0013 0100 231f 0017 ec49 0200 08af 0000 0257 0017 ec69 0100 3077 0000 0013
4001740  0200 08af 0000 00cf 0017 ec7d 0100 1ff7 0000 031b 0200 08af 0000 009f 0017 ec91 0100 3077 0000 000b 0200 0b3f 0000 2c47
4002020  0000 000b 0200 0b3f 0000 000f 0000 0013 0100 231f 0017 eca5 0200 08af 0000 0257 0017 ecc5 0100 3077 0000 000b 0200 08af
4002100  0000 00cf 0017 ecd9 0100 1ff7 0000 032b 0200 08af 0000 009f 0017 eced 0100 3077 0000 0013 0200 0b3f 0000 2c47 0000 0013
4002160  0200 0b3f 0000 000f 0000 0013 0100 231f 0017 ed01 0200 08af 0000 0257 0017 ed21 0000 3e8f b328 0013 0016 519c 0000 0000
4002240  0017 ed20 0017 abc0 0000 3ee7 b328 08af 0016 51d0 0000 0000 0017 ed38 0016 b054 0000 3f2f b328 2c47 0016 5204 0000 0000
4002320  000c 004c 0000 0000 0017 ed50 0017 ed60 0000 3f3f b328 0257 0016 5238 0000 0000 0000 3f47 b328 08af 0016 526c 0000 0000
4002400  0000 6eff b328 02fb 0016 52a0 0000 0000 0000 6ef7 b328 3077 0016 52d4 0000 0000 0000 2fdf b328 0013 0016 5308 0000 0000
4002460  001f 2240 2823 2938 392f 3035 2f30 3820 6361 7365 636f 6e76 2e70 6c09 3332 2e31 2200 08af 0016 b0f4 0100 2def 0000 7d07
4002540  0000 0004 0017 ee4c 0017 ee4c 0001 0080 0000 0000 0017 d100 0017 d064 0017 d098 0017 d0cc 0000 0029 0016 b12c b27c b66c
4002620  0000 10c8 7fff ffff 0018 9ff4 0200 0db5 0100 32b5 0000 7d07 0000 315f 0000 7d07 b328 00cf 0017 ee20 0000 0000 2cac 030b
4002700  0002 438a 2ca0 009f 0000 0000 0000 0001 0016 2444 0016 2444 0002 438a 0017 ee70 0016 2450 0011 6c6f 7765 725f 7570 7065
4002760  725f 6368 6172 7300 0011 7570 7065 725f 6c6f 7765 725f 6368 6172 7300 000a 636d 6f73 3130 6b2e 706c 0000 0000 0017 f051
4003040  0000 0000 0011 5740 0200 7d47 0000 7d07 0000 0008 0017 ef28 0017 ef28 0001 0080 0000 0000 0014 0ca8 0200 7d4f 0000 7d07
```

```
4003120  0000 0008 0017 ef79 0017 ef78 0001 0080 0000 0000 000b 2020 2020 207e 7720 3a7e 6e00 0000 0000 7f07 b328 1800 0017 f59c
4003200  0000 0000 27f0 0014 0016 5504 4e1c 0000 0000 0007 54a8 228c 2cac 0b3f 0002 438a 2ca0 0013 0000 0000 0000 0001 0017 ef14
4003260  0016 5504 0016 550e 0016 bd64 000c 7269 7070 6c65 5f61 6464 6572 00f4 0017 f00c 0000 0000 27f0 0014 0016 5580 4e1c 0000
4003340  0000 0007 54a8 228c 2cac 0b3f 0002 438a 2ca0 000b 0000 0000 0000 0001 0017 ef64 0016 5580 0016 558a 0017 ef9c 0017 ef70
4003420  000b 6c6f 7765 725f 6368 6172 7300 08af 000a 7465 6368 6e6f 6c6f 6779 0000 0000 0011 585c 0300 7d67 0000 7107 0000 000c
4003500  0017 f1a8 0017 f1a8 0001 0080 0000 0000 0014 0c68 0200 7d57 0000 7d07 0000 0008 0017 f014 0017 f014 0001 0080 0000 0000
4003560  27f0 0014 0017 f03c 4e1c 0000 0000 0ad7 3050 c5a8 2cac 1ff7 0002 438a 2ca0 08af 0000 0004 0000 0002 0017 f000 0017 f058
4003640  0017 f062 0017 eeac 0017 f274 28c4 0014 0017 f058 4e1c 0000 0000 0007 54a8 228c 0017 f048 0017 ef5c 2954 0024 0002 438a
4003720  56f8 671c 682c 5758 6750 6a00 24d0 0000 000c 44b8 0014 2330 0017 eff0 000b 7570 7065 725f 6368 6172 7300 0013 0000 7cff
4004000  b328 a47c 0017 ac2c 0000 0000 0011 582c 0200 7d5f 0000 7d07 0000 0009 0017 f0e0 0017 f0e0 0001 0080 0000 0000 0000 7e77
4004060  b328 08af 0017 8028 0000 0000 27f0 0014 0017 f104 4e1c 0000 0000 0ad7 3050 c5a8 2cac 3077 0002 438a 2ca0 08af 0000 0004
4004140  0000 0002 0017 f0cc 0017 f130 0017 f13a 0017 f118 28c4 0014 0017 f130 4e1c 0000 0000 0007 54a8 228c 0017 f129 0000 0000
4004220  0017 f0d8 0000 0000 0017 f110 0017 f120 2954 0024 0002 438a 56f8 671c 682c 5758 6750 6a00 24d0 0000 000c 44d8 0014 2330
4004300  0017 f0ac 000b 6469 7865 645f 6368 6172 7300 f0f4 0000 7cff b328 f0e9 0017 abd4 0000 0000 0000 7e77 b328 f259 0017 7ffc
4004360  0000 0000 0004 6461 7461 00f4 0005 6c63 6231 3500 27f0 0014 0017 f1cc 4e1c 0000 0000 0ad7 3050 c5a8 2cac f079 0002 438a
4004440  2ca0 f065 0000 0004 0000 0002 0017 f194 0017 f1f8 0017 a7bc 0017 f1e0 28c4 0014 0016 58cc 4e1c 0000 0000 0007 54a8 228c
4004520  0017 f1f1 0000 0000 0017 f1a0 0000 0000 0017 f1d8 0017 f1e8 2954 0020 0002 438a 56f8 6420 5758 6c34 6750 41fc 0000 0003
4004600  239c 0000 0017 efd0 000a 6368 6172 735f 6368 6172 0017 f21a 0014 0ce4 0200 7d6f 0000 7d07 0000 0008 0017 f27c 0017 f27c
4004660  0001 0080 0000 0000 000b 6361 7365 636f 6e76 2e70 6c00 0000 0003 6130 3600 f260 0017 ef04 000b 80cc 27f0 0014 0017 f2a0
4004740  4e1c 0000 0000 0007 3050 c5a8 2cac f272 0002 438a 2ca0 f27a 0000 0000 0000 0001 0017 f268 0017 f2b4 0017 a7d4 0017 f038
4005020  28c4 0012 0017 f2b4 56f8 671c 5fa0 48f8 228c ee29 2954 0014 0002 438a 56f8 5fa0 671c 22bc 0017 f238 000f 6c63 6d70 2020
4005100  7e77 203a 6e6f 717e 6e00 0000 0007 6f72 6465 7265 6400 7f2c 000f 6c6c 696e 6b20 7e77 203a 6e6f 717e 6e00 f2c8 0017 a47c
4005160  000a f27c 0003 6130 3400 0000 0005 6461 7461 3100 0012 c5e0 0000 0000 0017 cbf8 0017 f314 0017 cc28 0100 273f 0000 3287
4005240  0000 0004 0017 cbe8 0017 cbe8 0041 0000 0000 0000 0017 f324 0200 273f 0000 3287 0000 0008 0017 f364 0017 f364 0041 0000
4005320  0000 0000 2c78 0010 0002 438a 239c 0000 0017 cc38 0017 cc78 0100 7d2f 0000 3287 0000 0004 0017 f394 0017 f394 0041 0000
4005400  0000 0000 2c78 0010 0002 438a 239c 0000 0017 cc58 0017 f374 0200 7d2f 0000 3287 0000 0008 0017 f3c4 0017 f3c4 0041 0000
4005460  0000 0000 2c78 0010 0002 438a 239c 0000 0017 cc88 0017 ccc8 0100 3267 0000 3287 0000 0004 0017 f3f4 0017 f3f4 0041 0000
4005540  0000 0000 2c78 0010 0002 438a 239c 0000 0017 cca8 0017 f3d4 0200 3267 0000 3287 0000 0008 0017 f424 0017 f424 0041 0000
4005620  0000 0000 2c78 0010 0002 438a 239c 0000 0017 ccd8 0017 cce8 0200 7d37 0000 3287 0000 0008 0017 f454 0017 f454 0041 0000
4005700  0000 0000 2c78 0010 0002 438a 239c 0000 0017 ccf8 0007 6578 706c 6169 6e00 a4f0 2b24 acf4 0002 438a 0019 6186 0009 6465
4005760  6275 675f 616c 6c00 0007 6c76 6572 2e70 6c00 0000 0006 7275 6e6c 6273 0017 a7f8 b464 a778 0018 1e94 0000 0000 b464 f4a4
4006040  0011 77cc 0000 0000 0008 7275 6e5f 6c76 6572 00c4 0008 6c76 6572 2e63 7368 00d0 0009 6361 6c6c 5f6c 7665 7200 0007 636d
4006120  6f73 3130 6b00 f494 0017 f600 0000 002c b288 b66c 0000 1112 7fff ffff 0018 19ac 0200 0db5 0100 15ad 0100 33fd 0000 000b
4006200  0000 315f 0038 2f68 6f6d 652f 6f73 6173 312f 612f 7669 6a61 792f 5648 444c 2f70 6172 7365 722f 7072 6f6c 6f67 2f6e 6577
4006260  6e65 772f 7633 2e31 2f64 6562 7567 006b 003b 2f68 6f6d 652f 6f73 6173 312f 612f 7669 6a61 792f 5648 444c 2f70 6172 7365
4006340  722f 7072 6f6c 6f67 2f6e 6577 6e65 772f 7633 2e31 2f64 6562 7567 2e70 6c00 6465 0000 002c 0018 1a5c b27c b66c 0000 1115
4006420  7fff ffff 0017 7ff8 0200 0db5 0200 2f35 0000 7f07 0000 041b 0000 315f 0000 002c 0011 76fc b27c b66c 0000 1122 7fff ffff
4006500  0017 8024 0200 0db5 0200 224d 0000 7f07 0000 3287 0000 315f 2c78 0012 0002 438a 4e1c 0000 0000 7fdf 228c 0000 0017 f7b8
4006560  0000 0090 b27c b66c 0000 1117 0000 1121 000a d16d 0200 0db5 0200 270d 0000 7f07 0000 3287 0000 315f 0017 f664 0000 0038
4006640  b27c b66c 0000 1118 0000 1123 0017 f7bc 0200 0db5 0500 1cdd 0000 7f0f 0000 0003 0000 3287 00c1 cea3 0000 041b 0000 315f
4006720  0017 f7b8 0000 002c b4f0 b4e4 0000 1117 7fff ffff 0008 b0dd 0000 0000 0000 0000 0017 fa5c 0002 438a 0018 1788 2c78 0128
4007000  0002 438a 2520 43c0 0200 0daf 4b8c 0000 0000 3287 4b8c 0000 0000 5dff 24d0 0000 0008 e37c 000c 43c0 0200 0daf 4b8c 0000
4007060  0000 3287 4b8c 0000 0000 58c7 24d0 0000 0008 e37c 000c 43c0 0200 0daf 4b8c 0000 0000 3287 4b8c 0000 0000 5baf 24d0 0000
4007140  0008 e37c 000c 43c0 0200 0daf 4b8c 0000 0000 3287 4b8c 0000 0000 583f 24d0 0000 0008 e37c 000c 43c0 0200 0daf 4b8c 0000
4007220  0000 3287 4b8c 0000 0000 5caf 24d0 0000 0008 e37c 000c 43c0 0200 0daf 4b8c 0000 0000 3287 4b8c 0000 0000 5cdf 24d0 0000
4007300  0008 e37c 000c 43c0 0200 0daf 4b8c 0000 0000 3287 4b8c 0000 0000 5a97 24d0 0000 0008 e37c 000c 43c0 0200 0daf 4b8c 0000
4007360  0000 3287 4b8c 0000 0000 5dcf 24d0 0000 0008 e37c 000c 43c0 0200 0daf 4b8c 0000 0000 3287 4b8c 0000 0000 5cef 242c 0000
4007440  0008 e37c 0017 f958 0000 0038 b27c b66c 0000 1119 0000 1124 0017 f85c 0200 0db5 0500 1cdd 0000 7f17 0000 0003 0000 3287
4007520  00c1 d0a3 0000 041b 0000 315f 2c78 0068 0002 438a 2520 43c0 0200 0daf 4b8c 0000 0000 3287 4b8c 0000 0000 599f 24d0 0000
4007600  0008 e37c 000c 43c0 0200 0daf 4b8c 0000 0000 3287 4b8c 0000 0000 5a37 24d0 0000 0008 e37c 000c 43c0 0200 0daf 4b8c 0000
4007660  0000 3287 4b8c 0000 0000 5a6f 242c 0000 0008 e37c 0017 f8f8 0000 0039 b27c b66c 0000 111a 0000 1125 0017 f8fc 0200 0db5
4007740  0500 1cdd 0000 7f1f 0000 0003 0000 3287 00c1 d323 0000 041b 0000 315f 2c78 0068 0002 438a 2520 43c0 0200 0daf 4b8c 0000
4010020  0000 3287 4b8c 0000 0000 5657 24d0 0000 0008 e37c 000c 43c0 0200 0daf 4b8c 0000 0000 3287 4b8c 0000 0000 5667 24d0 0000
4010100  0008 e37c 000c 43c0 0200 0daf 4b8c 0000 0000 3287 4b8c 0000 0000 566f 242c 0000 0008 e37c 0017 f968 0000 0039 b27c b66c
4010160  0000 111b 0000 1126 0017 f96c 0200 0db5 0500 1cdd 0000 7f27 0000 0003 0000 3287 00c1 d823 0000 041b 0000 315f 2c78 0038
```

```
4010240 0002 438a 2520 43c0 0200 0daf 4b8c 0000 0000 3287 4b8c 0000 0000 58e7 24d0 0000 0008 e37c 000c 247c 0018 3b34 000c 234c
4010320 0018 3b54 0017 f9e8 0000 0039 b27c b66c 0000 111c 0000 1127 0017 f9ec 0200 0db5 0500 1cdd 0000 7f2f 0000 0003 0000 3287
4010400 00c1 d9a3 0000 041b 0000 315f 2c78 0048 0002 438a 2520 43c0 0200 0daf 4b8c 0000 0000 3287 4b8c 0000 0000 5407 24d0 0000
4010460 0008 e37c 000c 43c0 0200 0daf 4b8c 0000 0000 3287 4b8c 0000 0000 7f3f 242c 0000 0008 e37c 0017 fb78 0000 00a8 b27c b66c
4010540 0000 111d 0000 1128 0017 fa24 0200 0db5 0500 1cdd 0000 7f37 0000 0003 0000 3287 00c1 daa3 0000 041b 0000 315f 0017 fa58
4010620 0000 0038 b27c b66c 0000 111e 0000 1129 0017 fa5c 0200 0db5 0500 1cdd 0000 7f47 0000 0003 0000 3287 00c1 dea3 0000 041b
4010700 0000 315f 0017 fb78 0000 0038 b130 b66c 0000 111f 0000 112a 0017 f669 0200 0db5 0500 1cdd 0000 7f4f 0000 0003 0000 3287
4010760 00c1 e1a3 0000 041b 0000 315f 2c78 00e8 0002 438a 2520 43c0 0200 0daf 4b8c 0000 0000 3287 4b8c 0000 0000 5f97 24d0 0000
4011040 0008 e37c 000c 43c0 0200 0daf 4b8c 0000 0000 3287 4b8c 0000 0000 5fa7 24d0 0000 0008 e37c 000c 43c0 0200 0daf 4b8c 0000
4011120 0000 3287 4b8c 0000 0000 5e87 24d0 0000 0008 e37c 000c 43c0 0200 0daf 4b8c 0000 0000 3287 4b8c 0000 0000 5e7f 24d0 0000
4011200 0008 e37c 000c 43c0 0200 0daf 4b8c 0000 0000 3287 4b8c 0000 0000 5bb7 24d0 0000 0008 e37c 000c 43c0 0200 0daf 4b8c 0000
4011260 0000 3287 4b8c 0000 0000 5be7 24d0 0000 0008 e37c 000c 43c0 0200 0daf 4b8c 0000 0000 3287 4b8c 0000 0000 5bdf 242c 0000
4011340 0008 e37c 0018 19a8 0000 197c 652c 2027 3b27 2c0a 0909 0953 6372 6970 7446 696c 652c 2027 2031 3e20 2f64 6576 2f6e 756c
4011420 6c20 323e 2631 275d 2920 2d3e 2074 7275 650a 093b 0a09 0974 7275 650a 0929 2c0a 0977 7269 7465 2827 2020 2020 2045 7865
4011500 6375 7469 6f6e 2063 6f6d 706c 6574 6564 2e27 292c 6e6c 2c6e 6c2e 0a0a 2525 2525 2525 2525 2525 2525 2525 2525 2525 2525
4011560 2525 2525 2525 2525 2525 2525 2525 2525 2525 2525 2525 2525 2525 2525 2525 2525 2525 2525 2525 2525 2525 2525 2525 2525
4011640 2525 2525 2525 2525 2525 0a0a 7265 6d6f 7665 5f6c 7665 725f 6669 6c65 7328 4e65 7446 696c 652c 2053 6372 6970 7446 696c
4011720 6529 203a 2d0a 0973 7973 7465 6d28 5b27 2f62 696e 2f72 6d20 272c 2053 6372 6970 7446 696c 652c 2027 2027 2c0a 0909 4e65
4012000 7446 696c 652c 272e 7b4c 434d 504c 5354 2c4c 494e 4b4c 5354 2c44 454c 4345 4c2c 5844 454c 4345 4c2c 5349 4d2c 5645 524c
4012060 5354 7d20 275d 292e 0a09 090a 2525 2525 2525 2525 2525 2525 2525 2525 2525 2525 2525 2525 2525 2525 2525 2525 2525 2525
4012140 2525 2525 2525 2525 2525 2525 2525 2525 2525 2525 2525 2525 2525 2525 2525 2525 2525 2525 2525 2525 2525 0a65 7373 5f69
4012220 7465 6128 7379 6e6f 7073 7973 2c20 2770 6f72 7473 3a27 2c20 5b27 706f 7274 733a 272c 205f 5d29 3a2d 2021 2e0a 7072 6f63
4012300 6573 735f 6974 656d 2873 796e 6f70 7379 732c 2027 6e65 7473 3a27 2c20 5b27 6e65 7473 3a27 2c20 5f5d 293a 2d20 212e 0a70
4012360 726f 6365 7373 5f69 7465 6d28 7379 6e6f 7073 7973 2c20 2752 6570 6f72 7427 2c20 5b27 5265 706f 7274 272c 2027 3a27 2c20
4012440 5f5d 293a 2d20 212e 0a70 726f 6365 7373 5f69 7465 6d28 7379 6e6f 7073 7973 2c20 2744 6573 6967 6e27 2c20 5b27 4465 7369
4012520 676e 272c 2027 3a27 2c20 5f5d 293a 2d20 212e 0a0a 2525 0a25 2520 466f 7220 4453 500a 2525 0a70 726f 6365 7373 5f69 7465
4012600 6d28 6473 702c 2027 4255 5345 5327 2c20 5b27 4255 5345 5327 2c20 5f5d 2920 3a2d 2021 2e0a 7072 6f63 6573 735f 6974 656d
4012660 2864 7370 2c20 274d 554c 5449 504c 4558 4552 5327 2c20 5b27 4d55 4c54 4950 4c45 5845 5253 272c 205f 5d29 203a 2d20 212e
4012740 0a70 726f 6365 7373 5f69 7465 6d28 6473 702c 2027 4d55 4c54 4950 4c45 5845 5227 2c20 5b27 4d55 4c54 4950 4c45 5845 5227
4013020 2c20 2749 4e50 5554 5327 2c20 5f5d 2920 3a2d 2021 2e0a 7072 6f63 6573 735f 6974 656d 2864 7370 2c20 2752 4547 4953 5445
4013100 5253 3a27 2c20 5b27 5245 4749 5354 4552 533a 272c 2027 544f 5441 4c27 2c20 5f5d 2920 3a2d 2021 2e0a 7072 6f63 6573 735f
4013160 6974 656d 2864 7370 2c20 2743 4f4e 4e45 4354 494f 4e53 272c 205b 2743 4f4e 4e45 4354 494f 4e53 272c 205f 5d29 203a 2d20
4013240 212e 0a0a 2525 0a25 2520 466f 7220 6c76 6572 0a25 250a 7072 6f63 6573 735f 6974 656d 286c 7665 722c 2027 4741 5445 5327
4013320 2c20 5b27 4741 5445 5327 2c20 2755 5345 443a 272c 205f 5d29 2e0a 7072 6f63 6573 735f 6974 656d 286c 7665 722c 2027 4d41
4013400 5849 4d55 4d27 2c20 5b27 4d41 5849 4d55 4d27 2c20 2750 494e 5327 2c20 2750 4552 272c 2027 4e45 543a 272c 205f 5d29 2e0a
4013460 7072 6f63 6573 735f 6974 656d 286c 7665 722c 2027 4156 4552 4147 4527 2c20 5b27 4156 4552 4147 4527 2c20 2750 494e 5327
4013540 2c20 2750 4552 272c 2027 4e45 543a 272c 205f 5d29 2e0a 7072 6f63 6573 735f 6974 656d 286c 7665 722c 2027 494e 5055 5427
4013620 2c20 5b27 494e 5055 5427 2c20 2750 494e 5327 2c20 2728 4558 434c 5544 494e 4727 2c20 2742 4944 4952 4543 5449 4f4e 414c
4013700 272c 0a20 2020 2020 2020 2020 2020 2020 2020 2020 2020 2020 2020 2020 2750 494e 5329 3a27 2c20 5f2c 205f 5d29
4013760 2e0a 7072 6f63 6573 735f 6974 656d 286c 7665 722c 2027 4f55 5450 5554 272c 205b 274f 5554 5055 5427 2c20 2750 494e 5327
4014040 2c20 2728 4558 434c 5544 494e 4727 2c20 2742 4944 4952 4543 5449 4f4e 414c 272c 0a20 2020 2020 2020 2020 2020 2020 2020
4014120 2020 2020 2020 2020 2020 2020 2020 2027 5049 4e53 293a 272c 205f 2c20 5f5d 292e 0a70 726f 6365 7373 5f69 7465 6d28 6c76
4014200 6572 2c20 2750 4144 272c 205b 2750 4144 272c 2027 4c4f 4341 5449 4f4e 5327 2c20 2755 5345 4427 2c20 2746 4f52 272c 0a09
4014260 2020 2020 2020 2020 2020 2020 2020 2020 2020 2027 4249 4449 5245 4354 494f 4e41 4c27 2c20 2750 494e 533a 272c 205f 2c20
4014340 5f5d 292e 0a70 726f 6365 7373 5f69 7465 6d28 6c76 6572 2c20 2742 4944 4952 4543 5449 4f4e 414c 272c 205b 2742 4944 4952
4014420 4543 5449 4f4e 414c 272c 2027 5049 4e53 3a27 2c20 5f2c 205f 5d29 2e0a 0a25 250a 2525 2049 676e 6f72 6520 7265 7374 0a25
4014500 250a 7072 6f63 6573 735f 6974 656d 285f 2c20 5f2c 2069 676e 6f72 6529 3a2d 2021 2e09 0909 2520 6967 6e6f 7265 2072 6573
4014560 740a 0a25 2525 2525 2525 2525 2525 2525 2525 2525 2525 2525 2525 2525 2525 2525 2525 2525 2525 2525 2525 2525 2525 2525
4014640 2525 2525 2525 2525 2525 2525 2525 2525 2525 2525 2525 2525 2525 2525 2525 2525 250a 2525 2054 6865 2066 6f6c 6c6f 7769
4014720 6e67 2070 7265 6469 6361 7465 7320 7370 6563 6966 7920 686f 7720 746f 2069 6e74 6572 7072 6574 2074 6865 7365 206c 696e
4015000 6573 2e0a 2525 0a25 2520 436f 6d6d 6f6e 2066 6f72 2061 6c6c 0a25 250a 7072 6f63 6573 735f 6461 7461 285f 2c20 5f2c 205b
4015060 5d29 2e09 0909 2520 646f 6e65 2077 6974 6820 7468 6520 6669 6c65 210a 7072 6f63 6573 735f 6461 7461 285f 2c20 5f2c 2069
4015140 676e 6f72 6529 203a 2d20 2020 2020 2020 2020 2020 2520 6967 6e6f 7265 2074 6869 7320 7069 6563 6520 6f66 2064 6174 610a
4015220 0921 2c66 6169 6c2e 0a25 250a 2525 2046 6f72 2043 6869 7073 697a 6572 0a25 250a 7072 6f63 6573 735f 6461 7461 2863 6869
4015300 7073 697a 6572 2c20 5f2c 2044 6174 6129 203a 2d0a 0964 6573 6967 6e5f 7369 7a65 5f66 726f 6d5f 6461 7461 2853 697a 6558
```

| | | | | | | | | | | | | | | | | | | | | | | | | |
|---|---|---|---|---|---|---|---|---|---|---|---|---|---|---|---|---|---|---|---|---|---|---|---|---|
| 4015360 | 2c20 | 5369 | 7a65 | 592c | 2055 | 6e69 | 7473 | 2c20 | 4461 | 7461 | 292c | 0a09 | 7075 | 7464 | 625f | 6375 | 7272 | 556e | 7428 | 6368 | 6970 | 7369 | 7a65 | 725f |
| 4015440 | 7265 | 706f | 7274 | 2c20 | 5b53 | 697a | 6558 | 2c20 | 5369 | 7a65 | 592c | 2055 | 6e69 | 7473 | 5d29 | 2c0a | 0921 | 2c66 | 6169 | 6c2e | 0a25 | 250a | 2525 | 2046 |
| 4015520 | 6f72 | 2053 | 796e | 6f70 | 7379 | 730a | 2525 | 0a70 | 726f | 6365 | 7373 | 5f64 | 6174 | 6128 | 7379 | 6e6f | 7073 | 7973 | 2c20 | 5f2c | 2044 | 6174 | 6129 | 203a |
| 4015600 | 2d0a | 0969 | 6e66 | 5f5f | 6672 | 6f6d | 5f64 | 6174 | 6128 | 7379 | 6e6f | 7073 | 7973 | 2c20 | 5479 | 7065 | 2c20 | 5661 | 6c75 | 652c | 2044 | 6174 | 6129 | 2c0a |
| 4015660 | 0970 | 7574 | 6462 | 5f63 | 7572 | 7265 | 6e74 | 2873 | 796e | 6f70 | 7379 | 735f | 7265 | 706f | 7274 | 2c20 | 5b54 | 7970 | 652c | 2056 | 616c | 7565 | 5d29 | 2c0a |
| 4015740 | 0921 | 2c66 | 6169 | 6c2e | 0a25 | 250a | 2525 | 2046 | 6f72 | 2044 | 5350 | 0a25 | 250a | 7072 | 6f63 | 6573 | 735f | 6461 | 7461 | 2864 | 7370 | 2c20 | 5f2c | 2044 |
| 4016020 | 6174 | 6129 | 203a | 2d0a | 0969 | 6e66 | 6f5f | 6672 | 6f6d | 5f64 | 6174 | 6128 | 6473 | 702c | 2054 | 7970 | 652c | 204e | 756d | 6265 | 722c | 2044 | 6174 | 6129 |
| 4016100 | 2c0a | 096e | 7561 | 6265 | 7228 | 4e75 | 6d62 | 6572 | 292c | 0a09 | 7075 | 7464 | 625f | 6375 | 7272 | 656e | 7428 | 6473 | 705f | 7265 | 706f | 7274 | 2c20 | 5b54 |
| 4016160 | 7970 | 652c | 204e | 756d | 6265 | 725d | 292c | 0a09 | 212c | 6661 | 696c | 2e0a | 2525 | 0a25 | 2520 | 466f | 7220 | 6c76 | 6572 | 0a25 | 2520 | 0a70 | 726f | 6365 |
| 4016240 | 7373 | 5f64 | 6174 | 6128 | 6c76 | 6572 | 2c20 | 5f2c | 2044 | 6174 | 6129 | 203a | 2d0a | 0969 | 6e66 | 6f5f | 6672 | 6f6d | 5f64 | 6174 | 6128 | 6c76 | 6572 | 2c20 |
| 4016320 | 5479 | 7065 | 2c20 | 4e75 | 6d62 | 6572 | 2c20 | 4461 | 7461 | 292c | 0a09 | 6e75 | 6d62 | 6572 | 284e | 756d | 6265 | 7229 | 2c0a | 0970 | 7574 | 6462 | 5f63 | 7572 |
| 4016400 | 7265 | 6e74 | 286c | 7665 | 725f | 7265 | 706f | 7274 | 2c20 | 5b54 | 7970 | 652c | 204e | 756d | 6265 | 725d | 292c | 0a09 | 212c | 6661 | 696c | 2e0a | 0a25 | 250a |
| 4016460 | 2525 | 2047 | 656e | 6572 | 6963 | 0a25 | 2520 | 0a25 | 7072 | 6f63 | 6573 | 735f | 6461 | 7461 | 2850 | 726f | 6772 | 616d | 2c20 | 5f2c | 2044 | 6174 | 6129 | 203a |
| 4016540 | 2d0a | 2509 | 7075 | 7464 | 625f | 6375 | 7272 | 656e | 7428 | 5072 | 6f67 | 7261 | 612c | 2044 | 6174 | 6129 | 2c0a | 2509 | 212c | 6661 | 696c | 2e0a | 0a25 | 2525 |
| 4016620 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 4016700 | 2525 | 2525 | 2525 | 2525 | 2525 | 2525 | 2525 | 2525 | 2525 | 2525 | 2525 | 2525 | 2525 | 250a | 2525 | 2525 | 2041 | 7578 | 696c | 6c69 | 6172 | 7920 | 7072 | 6564 |
| 4016760 | 6963 | 6174 | 6573 | 2064 | 6566 | 696e | 6564 | 2066 | 6f72 | 2063 | 6f6e | 7665 | 6e69 | 656e | 6365 | 2e0a | 0a25 | 2525 | 2520 | 666f | 7220 | 6368 | 6970 | 7369 |
| 4017040 | 7a65 | 720a | 6465 | 7369 | 676e | 5f73 | 697a | 655f | 6672 | 6f6d | 5f64 | 6174 | 6128 | 5369 | 7a65 | 582c | 2053 | 697a | 6559 | 2c20 | 556e | 6974 | 732c | 0a09 |
| 4017120 | 0920 | 2020 | 2020 | 205b | 2745 | 7374 | 696d | 6174 | 6564 | 272c | 6675 | 6e63 | 7469 | 6f6e | 2c73 | 697a | 652c | 5369 | 7a65 | 582c | 556e | 6974 | 732c | 5f2c |
| 4017200 | 5369 | 7a65 | 592c | 5f5d | 292e | 0a0a | 2525 | 2525 | 2066 | 6f72 | 2073 | 796e | 6f70 | 7379 | 730a | 696e | 666f | 5f66 | 726f | 6d5f | 6461 | 7461 | 2873 | 796e |
| 4017260 | 6f70 | 7379 | 732c | 2063 | 6f6d | 6269 | 6e61 | 7469 | 6f6e | 616c | 5f61 | 7265 | 612c | 2041 | 7265 | 612c | 205b | 2743 | 6f6d | 6269 | 6e61 | 7469 | 6f6e | 616c |
| 4017340 | 272c | 2027 | 6172 | 6561 | 3a27 | 2c20 | 4172 | 6561 | 5d29 | 2e0a | 696e | 666f | 5f66 | 726f | 6d5f | 6461 | 7461 | 2873 | 796e | 6f70 | 7379 | 732c | 206e | 6f6e |
| 4017420 | 636f | 6d62 | 696e | 6174 | 696f | 6e61 | 6c5f | 6172 | 6561 | 2c41 | 7265 | 612c | 5b27 | 4e6f | 6e63 | 6f6d | 6269 | 6e61 | 7469 | 6f6e | 616c | 272c | 2761 | 7265 |
| 4017500 | 613a | 272c | 2041 | 7265 | 615d | 292e | 0a69 | 6e66 | 6f5f | 6672 | 6f6d | 5f64 | 6174 | 6128 | 7379 | 6e6f | 7073 | 7973 | 2c20 | 6e65 | 745f | 696e | 7465 | 7263 |
| 4017560 | 5f6e | 6e65 | 6374 | 5f61 | 7265 | 612c | 4172 | 6561 | 2c5b | 274e | 6574 | 272c | 2749 | 6e74 | 6572 | 636f | 6e6e | 6563 | 7427 | 2c27 | 6172 | 6561 | 3a27 | 2c41 |
| 4017640 | 7265 | 615d | 292e | 0a69 | 6e66 | 6f5f | 6672 | 6f6d | 5f64 | 6174 | 6128 | 7379 | 6e6f | 7073 | 7973 | 2c20 | 746f | 7461 | 6c5f | 6172 | 6561 | 2c20 | 4172 | 6561 |
| 4017720 | 2c20 | 5b27 | 546f | 7461 | 6c27 | 2c20 | 2761 | 7265 | 613a | 272c | 2041 | 7265 | 615d | 292e | 0a69 | 6e66 | 6f5f | 6672 | 6f6d | 5f64 | 6174 | 6128 | 7379 | 6e6f |
| 4020000 | 7073 | 7973 | 2c20 | 706f | 7274 | 732c | 204e | 756d | 6265 | 722c | 205b | 2770 | 6f72 | 7473 | 3a27 | 2c20 | 4e75 | 6d62 | 6572 | 5d29 | 2e0a | 696e | 666f | 5f66 |
| 4020060 | 726f | 6d5f | 6461 | 7461 | 2873 | 796e | 6f70 | 7379 | 732c | 206e | 6574 | 732c | 204e | 756d | 6265 | 722c | 205b | 276e | 6574 | 733a | 272c | 204e | 756d | 6265 |
| 4020140 | 725d | 292e | 0a69 | 6e66 | 6f5f | 6672 | 6f6d | 5f64 | 6174 | 6128 | 7379 | 6e6f | 7073 | 7973 | 2c20 | 7265 | 706f | 7274 | 2c20 | 5479 | 7065 | 2c20 | 5b27 | 5265 |
| 4020220 | 706f | 7274 | 272c | 2027 | 3a27 | 2c20 | 5479 | 7065 | 5d29 | 2e0a | 696e | 666f | 5f66 | 726f | 6d5f | 6461 | 7461 | 2873 | 796e | 6f70 | 7379 | 732c | 2064 | 6573 |
| 4020300 | 6967 | 6e2c | 204e | 616d | 652c | 205b | 2744 | 6573 | 6967 | 6e27 | 2c20 | 273a | 272c | 204e | 616d | 655d | 292e | 0a0a | 2525 | 2525 | 2066 | 6f72 | 2064 | 7370 |
| 4020360 | 0a69 | 6e66 | 6f5f | 6672 | 6f6d | 5f64 | 6174 | 6128 | 6473 | 702c | 2062 | 7573 | 6573 | 2c20 | 4e75 | 6d62 | 6572 | 2c20 | 5b27 | 4255 | 5345 | 5327 | 2c20 | 4e75 |
| 4020440 | 6d62 | 6572 | 5d29 | 2e0a | 696e | 666f | 5f66 | 726f | 6d5f | 6461 | 7461 | 2864 | 7370 | 2c20 | 6d75 | 7865 | 732c | 204e | 756d | 6265 | 722c | 205b | 274d | 554c |
| 4020520 | 5449 | 504c | 4558 | 4552 | 5327 | 2c20 | 4e75 | 6d62 | 6572 | 5d29 | 2e0a | 696e | 666f | 5f66 | 726f | 6d5f | 6461 | 7461 | 2864 | 7370 | 2c20 | 6d75 | 785f | 696e |
| 4020600 | 7075 | 7473 | 2c20 | 4e75 | 6d62 | 6572 | 2c20 | 5b27 | 4d55 | 4c54 | 4950 | 4c45 | 5845 | 5227 | 2c20 | 2749 | 4e50 | 5554 | 5327 | 2c20 | 4e75 | 6d62 | 6572 | 5d29 |
| 4020660 | 2e0a | 696e | 666f | 5f66 | 726f | 6d5f | 6461 | 7461 | 2864 | 7370 | 2c20 | 7265 | 6769 | 7374 | 6572 | 732c | 204e | 756d | 6265 | 722c | 205b | 2752 | 4547 | 4953 |
| 4020740 | 5445 | 5253 | 3a27 | 2c20 | 2754 | 4f54 | 414c | 272c | 204e | 756d | 6265 | 725d | 292e | 0a69 | 6e66 | 6f5f | 6672 | 6f6d | 5f64 | 6174 | 6128 | 6473 | 702c | 2063 |
| 4021020 | 6f6e | 6e65 | 6374 | 696f | 6e73 | 2c20 | 4e75 | 6d62 | 6572 | 2c20 | 5b27 | 434f | 4e4e | 4543 | 5449 | 4f4e | 5327 | 2c20 | 4e75 | 6d62 | 6572 | 5d29 | 2e0a | 0a25 |
| 4021100 | 2525 | 2520 | 666f | 7220 | 6c76 | 6572 | 0a69 | 6e66 | 6f5f | 6672 | 6f6d | 5f64 | 6174 | 6128 | 6c76 | 6572 | 2c20 | 6761 | 7465 | 735f | 7573 | 6564 | 2c20 | 4e75 |
| 4021160 | 6d62 | 6572 | 2c20 | 5b27 | 4741 | 5445 | 5327 | 2c20 | 2755 | 5345 | 443a | 272c | 204e | 756d | 6265 | 725d | 292e | 0a69 | 6e66 | 6f5f | 6672 | 6f6d | 5f64 | 6174 |
| 4021240 | 6128 | 6c76 | 6572 | 2c20 | 6176 | 6572 | 6167 | 655f | 7069 | 6e73 | 5f70 | 6572 | 5f6e | 6574 | 2c20 | 4e75 | 6d62 | 6572 | 2c0a | 095b | 2741 | 5645 | 5241 | 4745 |
| 4021320 | 272c | 2027 | 5049 | 4e53 | 272c | 2027 | 5045 | 5227 | 2c20 | 274e | 4554 | 3a27 | 2c20 | 4e75 | 6d62 | 6572 | 5d29 | 2e0a | 696e | 666f | 5f66 | 726f | 6d5f | 6461 |
| 4021400 | 7461 | 286c | 7665 | 722c | 206d | 6178 | 5f70 | 696e | 735f | 7065 | 725f | 6e65 | 742c | 204e | 756d | 6265 | 722c | 0a09 | 5b27 | 4d41 | 5849 | 4d55 | 4d27 | 2c20 |
| 4021460 | 2750 | 494e | 5327 | 2c20 | 2750 | 4552 | 272c | 2027 | 4e45 | 543a | 272c | 204e | 756d | 6265 | 725d | 292e | 0a69 | 6e66 | 6f5f | 6672 | 6f6d | 5f64 | 6174 | 6128 |
| 4021540 | 6c76 | 6572 | 2c20 | 696e | 7075 | 745f | 7069 | 6e73 | 2c20 | 4e75 | 6d62 | 6572 | 2c0a | 095b | 2749 | 4e50 | 5554 | 272c | 2027 | 5049 | 4e53 | 272c | 2027 | 2845 |
| 4021620 | 5843 | 4c55 | 4449 | 4e47 | 272c | 2742 | 4944 | 4952 | 4543 | 5449 | 4f4e | 414c | 272c | 2750 | 494e | 5329 | 3a27 | 2c5f | 2c4e | 756d | 6265 | 725d | 292e | 0a69 |
| 4021700 | 6e66 | 6f5f | 6672 | 6f6d | 5f64 | 6174 | 6128 | 6c76 | 6572 | 2c20 | 6f75 | 7470 | 7574 | 5f70 | 696e | 732c | 204e | 756d | 6265 | 722c | 0a09 | 5b27 | 4f55 | 5450 |
| 4021760 | 5554 | 272c | 2027 | 5049 | 4e53 | 272c | 2027 | 2845 | 5843 | 4c55 | 4449 | 4e47 | 272c | 2742 | 4944 | 4952 | 4543 | 5449 | 4f4e | 414c | 272c | 2750 | 494e | 5329 |
| 4022040 | 3a27 | 2c5f | 2c4e | 756d | 6265 | 725d | 292e | 0a69 | 6e66 | 6f5f | 6672 | 6f6d | 5f64 | 6174 | 6128 | 6c76 | 6572 | 2c20 | 6269 | 6469 | 7265 | 6374 | 696f | 6e61 |
| 4022120 | 6c5f | 7069 | 6e73 | 2c20 | 4e75 | 6d62 | 6572 | 2c0a | 095b | 2742 | 4944 | 4952 | 4543 | 5449 | 4f4e | 414c | 272c | 2027 | 5049 | 4e53 | 3a27 | 2c20 | 5f2c | 204e |
| 4022200 | 756d | 6265 | 725d | 292e | 0a25 | 696e | 666f | 5f66 | 726f | 6d5f | 6461 | 7461 | 286c | 7665 | 722c | 2070 | 6164 | 5f6c | 6f63 | 6174 | 696f | 6e73 | 2c20 | 4e75 |
| 4022260 | 6d62 | 6572 | 2c0a | 2509 | 5b27 | 5041 | 4427 | 2c27 | 4c4f | 4341 | 5449 | 4f4e | 5327 | 2c27 | 5553 | 4544 | 272c | 2746 | 4f52 | 272c | 2742 | 4944 | 4952 | 4543 |
| 4022340 | 5449 | 4f4e | 414c | 272c | 2750 | 494e | 533a | 272c | 205f | 2c20 | 4e75 | 6d62 | 6572 | 5d29 | 2e0a | 2525 | 2525 | 2525 | 2525 | 2525 | 2525 | 2525 | 2525 | 2525 |
| 4022420 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |

| | | | | | | | | | | | | | | | | | | | | | | | | |
|---|---|---|---|---|---|---|---|---|---|---|---|---|---|---|---|---|---|---|---|---|---|---|---|---|
| 4022500 | 2525 | 2525 | 2525 | 2525 | 2525 | 2525 | 0200 | 2c47 | 0000 | 0013 | 0200 | 0b3f | 0000 | 000f | 0000 | 0013 | 0100 | 231f | 0018 | 0de5 | 0200 | 08af | 0000 | 0257 |
| 4022560 | 0018 | 0e05 | 0100 | 3077 | 0000 | 0013 | 0200 | 08af | 0000 | 00cf | 0018 | 0e19 | 0100 | 1ff7 | 0000 | 034b | 0200 | 08af | 0000 | 009f | 0018 | 0e2d | 0100 | 3077 |
| 4022640 | 0000 | 000b | 0200 | 0b3f | 0000 | 2c47 | 0000 | 000b | 0200 | 0b3f | 0000 | 000f | 0000 | 0013 | 0100 | 231f | 0018 | 0e41 | 0200 | 08af | 0000 | 0257 | 0018 | 0e61 |
| 4022720 | 0100 | 3077 | 0000 | 000b | 0200 | 08af | 0000 | 00cf | 0018 | 0e75 | 0100 | 1ff7 | 0000 | 03a3 | 0200 | 08af | 0000 | 009f | 0018 | 0e89 | 0100 | 3077 | 0000 | 0013 |
| 4023000 | 0200 | 0b3f | 0000 | 2c47 | 0000 | 0013 | 0200 | 0b3f | 0000 | 000f | 0000 | 0013 | 0100 | 231f | 0018 | 0e9d | 0200 | 08af | 0000 | 0257 | 0018 | 0ebd | 0100 | 3077 |
| 4023060 | 0000 | 0013 | 0200 | 08af | 0000 | 00cf | 0018 | 0ed1 | 0100 | 1ff7 | 0000 | 030b | 0200 | 08af | 0000 | 009f | 0018 | 0ee5 | 0100 | 3077 | 0000 | 000b | 0200 | 0b3f |
| 4023140 | 0000 | 2c47 | 0000 | 000b | 0200 | 0b3f | 0000 | 000f | 0000 | 0013 | 0100 | 231f | 0018 | 0ef9 | 0200 | 08af | 0000 | 0257 | 0018 | 0f19 | 0100 | 3077 | 0000 | 000b |
| 4023220 | 0200 | 08af | 0000 | 00cf | 0018 | 0f2d | 0100 | 1ff7 | 0000 | 0393 | 0200 | 08af | 0000 | 009f | 0018 | 0f41 | 0100 | 3077 | 0000 | 0013 | 0200 | 0b3f | 0000 | 2c47 |
| 4023300 | 0000 | 0013 | 0200 | 0b3f | 0000 | 000f | 0000 | 0013 | 0100 | 231f | 0018 | 0f55 | 0200 | 08af | 0000 | 0257 | 0018 | 0f75 | 0100 | 3077 | 0000 | 0013 | 0200 | 08af |
| 4023360 | 0000 | 00cf | 0018 | 0f89 | 0100 | 1ff7 | 0000 | 030b | 0200 | 08af | 0000 | 009f | 0018 | 0f9d | 0100 | 3077 | 0000 | 000b | 0200 | 0b3f | 0000 | 2c47 | 0000 | 000b |
| 4023440 | 0200 | 0b3f | 0000 | 000f | 0000 | 0013 | 0100 | 231f | 0018 | 0fb1 | 0200 | 08af | 0000 | 0257 | 0018 | 0fd1 | 0100 | 3077 | 0000 | 000b | 0200 | 08af | 0000 | 00cf |
| 4023520 | 0018 | 0fe5 | 0100 | 1ff7 | 0000 | 0363 | 0200 | 08af | 0000 | 009f | 0018 | 0ff9 | 0100 | 3077 | 0000 | 0013 | 0200 | 0b3f | 0000 | 2c47 | 0000 | 0013 | 0200 | 0b3f |
| 4023600 | 0000 | 000f | 0000 | 0013 | 0100 | 231f | 0018 | 100d | 0200 | 08af | 0000 | 0257 | 0018 | 102d | 0100 | 3077 | 0000 | 0013 | 0200 | 08af | 0000 | 00cf | 0018 | 1041 |
| 4023660 | 0100 | 1ff7 | 0000 | 031b | 0200 | 08af | 0000 | 009f | 0018 | 1055 | 0100 | 3077 | 0000 | 000b | 0200 | 0b3f | 0000 | 2c47 | 0000 | 000b | 0200 | 0b3f | 0000 | 000f |
| 4023740 | 0000 | 0013 | 0100 | 231f | 0018 | 1069 | 0200 | 08af | 0000 | 0257 | 0018 | 1089 | 0100 | 3077 | 0000 | 000b | 0200 | 08af | 0000 | 00cf | 0018 | 109d | 0100 | 1ff7 |
| 4024020 | 0000 | 032b | 0200 | 08af | 0000 | 009f | 0018 | 10b1 | 0100 | 3077 | 0000 | 0013 | 0200 | 0b3f | 0000 | 2c47 | 0000 | 0013 | 0200 | 0b3f | 0000 | 000f | 0000 | 0013 |
| 4024100 | 0100 | 231f | 0018 | 10c5 | 0200 | 08af | 0000 | 0257 | 0018 | 10e5 | 0100 | 3077 | 0000 | 0013 | 0200 | 08af | 0000 | 00cf | 0018 | 10f9 | 0100 | 1ff7 | 0000 | 0323 |
| 4024160 | 0200 | 08af | 0000 | 009f | 0018 | 110d | 0100 | 3077 | 0000 | 000b | 0200 | 0b3f | 0000 | 2c47 | 0000 | 000b | 0200 | 0b3f | 0000 | 000f | 0000 | 0013 | 0100 | 231f |
| 4024240 | 0018 | 1121 | 0200 | 08af | 0000 | 0257 | 0018 | 1141 | 0100 | 3077 | 0000 | 000b | 0200 | 08af | 0000 | 00cf | 0018 | 1155 | 0100 | 1ff7 | 0000 | 02fb | 0200 | 08af |
| 4024320 | 0000 | 009f | 0018 | 1169 | 0100 | 3077 | 0000 | 0013 | 0200 | 0b3f | 0000 | 2c47 | 0000 | 0013 | 0200 | 0b3f | 0000 | 000f | 0000 | 0013 | 0100 | 231f | 0018 | 117d |
| 4024400 | 0200 | 08af | 0000 | 0257 | 0018 | 119d | 0100 | 3077 | 0000 | 0013 | 0200 | 08af | 0000 | 00cf | 0018 | 11b1 | 0100 | 1ff7 | 0000 | 036b | 0200 | 08af | 0000 | 009f |
| 4024460 | 0018 | 11c5 | 0100 | 3077 | 0000 | 000b | 0200 | 0b3f | 0000 | 2c47 | 0000 | 000b | 0200 | 0b3f | 0000 | 000f | 0000 | 0013 | 0100 | 231f | 0018 | 11d9 | 0200 | 08af |
| 4024540 | 0000 | 0257 | 0018 | 11f9 | 0100 | 3077 | 0000 | 000b | 0200 | 08af | 0000 | 00cf | 0018 | 120d | 0100 | 1ff7 | 0000 | 030b | 0200 | 08af | 0000 | 009f | 0018 | 1221 |
| 4024620 | 0100 | 3077 | 0000 | 0013 | 0200 | 0b3f | 0000 | 2c47 | 0000 | 0013 | 0200 | 0b3f | 0000 | 000f | 0000 | 0013 | 0100 | 231f | 0018 | 1235 | 0200 | 08af | 0000 | 0257 |
| 4024700 | 0018 | 1255 | 0100 | 3077 | 0000 | 0013 | 0200 | 08af | 0000 | 00cf | 0018 | 1269 | 0100 | 1ff7 | 0000 | 0393 | 0200 | 08af | 0000 | 009f | 0018 | 127d | 0100 | 3077 |
| 4024760 | 0000 | 000b | 0200 | 0b3f | 0000 | 2c47 | 0000 | 000b | 0200 | 0b3f | 0000 | 000f | 0000 | 0013 | 0100 | 231f | 0018 | 1291 | 0200 | 08af | 0000 | 0257 | 0018 | 12b1 |
| 4025040 | 0100 | 3077 | 0000 | 000b | 0200 | 08af | 0000 | 00cf | 0018 | 12c5 | 0100 | 1ff7 | 0000 | 033b | 0200 | 08af | 0000 | 009f | 0018 | 12d9 | 0100 | 3077 | 0000 | 0013 |
| 4025120 | 0200 | 0b3f | 0000 | 2c47 | 0000 | 0013 | 0200 | 0b3f | 0000 | 000f | 0000 | 0013 | 0100 | 231f | 0018 | 12ed | 0200 | 08af | 0000 | 0257 | 0018 | 130d | 0100 | 3077 |
| 4025200 | 0000 | 0013 | 0200 | 08af | 0000 | 00cf | 0018 | 1321 | 0100 | 1ff7 | 0000 | 037b | 0200 | 08af | 0000 | 009f | 0018 | 1335 | 0100 | 3077 | 0000 | 000b | 0200 | 0b3f |
| 4025260 | 0000 | 2c47 | 0000 | 000b | 0200 | 0b3f | 0000 | 000f | 0000 | 0013 | 0100 | 231f | 0018 | 1349 | 0200 | 08af | 0000 | 0257 | 0018 | 1369 | 0100 | 3077 | 0000 | 000b |
| 4025340 | 0200 | 08af | 0000 | 00cf | 0018 | 137d | 0100 | 1ff7 | 0000 | 0393 | 0200 | 08af | 0000 | 009f | 0018 | 1391 | 0100 | 3077 | 0000 | 0013 | 0200 | 0b3f | 0000 | 2c47 |
| 4025420 | 0000 | 0013 | 0200 | 0b3f | 0000 | 000f | 0000 | 0013 | 0100 | 231f | 0018 | 13a5 | 0200 | 08af | 0000 | 0257 | 0018 | 13c5 | 0100 | 3077 | 0000 | 0013 | 0200 | 08af |
| 4025500 | 0000 | 00cf | 0018 | 13d9 | 0100 | 1ff7 | 0000 | 0383 | 0200 | 08af | 0000 | 009f | 0018 | 13ed | 0100 | 3077 | 0000 | 000b | 0200 | 0b3f | 0000 | 2c47 | 0000 | 000b |
| 4025560 | 0200 | 0b3f | 0000 | 000f | 0000 | 0013 | 0100 | 231f | 0018 | 1401 | 0200 | 08af | 0000 | 0257 | 0018 | 1421 | 0100 | 3077 | 0000 | 000b | 0200 | 08af | 0000 | 00cf |
| 4025640 | 0018 | 1435 | 0100 | 1ff7 | 0000 | 0313 | 0200 | 08af | 0000 | 009f | 0018 | 1449 | 0100 | 3077 | 0000 | 0013 | 0200 | 0b3f | 0000 | 2c47 | 0000 | 0013 | 0200 | 0b3f |
| 4025720 | 0000 | 000f | 0000 | 0013 | 0100 | 231f | 0018 | 145d | 0200 | 08af | 0000 | 0257 | 0018 | 147d | 0100 | 3077 | 0000 | 0013 | 0200 | 08af | 0000 | 00cf | 0018 | 1491 |
| 4026000 | 0100 | 1ff7 | 0000 | 03ab | 0200 | 08af | 0000 | 009f | 0018 | 14a5 | 0100 | 3077 | 0000 | 000b | 0200 | 08af | 0000 | 0257 | 0018 | 14b9 | 0100 | 3077 | 0000 | 000b |
| 4026060 | 0200 | 08af | 0000 | 00cf | 0018 | 14cd | 0100 | 1ff7 | 0000 | 039b | 0200 | 08af | 0000 | 009f | 0018 | 14e1 | 0100 | 3077 | 0000 | 0013 | 0017 | 6525 | 0018 | 0ce6 |
| 4026140 | 0008 | db6c | 0100 | 7d7f | 0000 | 3287 | 0000 | 0004 | 0017 | acf0 | 0017 | acf0 | 0001 | 0081 | 0000 | 0000 | 0017 | cf74 | 0018 | 14f0 | 0300 | 7d7f | 0000 | 3287 |
| 4026220 | 0000 | 000c | 0017 | adb4 | 0017 | adb4 | 0001 | 0081 | 0000 | 0000 | 0017 | 6372 | 6561 | 7465 | 5f6c | 7665 | 725f | 7363 | 7269 | 7074 | 5f66 | 696c | 6500 | 1485 |
| 4026300 | 0014 | 0e18 | 0200 | 7d8f | 0000 | 3287 | 0000 | 0008 | 0017 | ae1c | 0017 | ae1c | 0001 | 0081 | 0000 | 0000 | 0014 | 0e6c | 0100 | 7d97 | 0000 | 3287 | 0000 | 0004 |
| 4026360 | 0017 | af0c | 0017 | af0c | 0001 | 0081 | 0000 | 0000 | 0014 | 0ea0 | 0200 | 7d9f | 0000 | 3287 | 0000 | 0008 | 0017 | aff4 | 0017 | aff4 | 0001 | 0081 | 0000 | 0000 |
| 4026440 | 001f | 2321 | 2f62 | 696e | 2f63 | 7368 | 202d | 667e | 6e73 | 6f75 | 7263 | 6520 | 7e7e | 2f2e | 6d64 | 657e | 6e00 | 15c6 | 000f | 6c76 | 6572 | 2020 | 7e77 | 203a |
| 4026520 | 6e6f | 717e | 6e00 | 1329 | 0019 | 2020 | 2020 | 2045 | 7865 | 6375 | 7469 | 6f6e | 2363 | 6f6d | 706c | 6574 | 6564 | 2e00 | 0015 | 2020 | 2020 | 2045 | 7865 | 6375 |
| 4026600 | 7469 | 6e67 | 206c | 6273 | 2e2e | 2e00 | 0017 | ede4 | 0400 | 73ef | 0000 | 3287 | 0000 | 0010 | 0017 | ce3c | 0017 | ce3c | 0001 | 007f | 0000 | 0000 | 0011 | 5ff4 |
| 4026660 | 0500 | 74f7 | 0000 | 3287 | 0000 | 0014 | 0018 | 171c | 0018 | 171c | 0001 | 007f | 0000 | 0000 | 0012 | 6361 | 7272 | 795f | 7365 | 6c65 | 6374 | 5f61 | 6464 | 6572 |
| 4026740 | 0018 | 1666 | 0016 | 6361 | 7272 | 795f | 6c6f | 6f6b | 5f61 | 6865 | 6164 | 5f61 | 6464 | 6572 | 0018 | 11a5 | 0014 | 13ec | 0200 | 7e27 | 0000 | 3287 | 0000 | 0008 |
| 4027020 | 0018 | 16b0 | 0018 | 16b0 | 0001 | 007f | 0000 | 0000 | 2cac | 16a6 | 0002 | 438a | 2ca0 | 16ae | 0000 | 0000 | 0000 | 0001 | 0017 | cf68 | 0017 | cf68 | 0002 | 438a |
| 4027100 | 0018 | 1510 | 0018 | 163c | 0200 | 7df7 | 0000 | 3287 | 0000 | 0008 | 0018 | 16f4 | 0018 | 16f4 | 0001 | 007f | 0000 | 0000 | 2cac | 10d9 | 0002 | 438a | 2ca0 | 10a5 |
| 4027160 | 0000 | 0000 | 0000 | 0001 | 0017 | cfd4 | 0017 | cfd4 | 0002 | 438a | 0018 | 1718 | 0017 | cfe0 | 2cac | 107d | 0002 | 438a | 2ca0 | 1049 | 0000 | 000c | 0000 | 0004 |
| 4027240 | 0017 | d058 | 0017 | d0f4 | 0002 | 438a | 0017 | ee04 | 27f0 | 0012 | 0018 | a104 | 4e1c | 0000 | 0000 | 0007 | 228c | 4e14 | 2c78 | 0014 | 0002 | 438a | 3640 | 35c8 |
| 4027320 | 3588 | 22bc | 0018 | a140 | 0012 | bbfc | 0200 | 777f | 0000 | 3287 | 0000 | 0008 | 0018 | 17a4 | 0018 | 17a4 | 0001 | 0082 | 0000 | 0000 | 0017 | f5f4 | 27f0 | 0018 |
| 4027400 | 0018 | 17cc | 4e1c | 0000 | 0000 | 7e7f | 52c4 | 0000 | 0000 | 0013 | 2cac | 0f21 | 0002 | 438a | 2ca0 | 0f0d | 0000 | 003c | 0000 | 000f | 0018 | 178c | 0018 | 198c |
| 4027460 | 0002 | 438a | 0017 | 80ec | 0017 | 8054 | 28c4 | 0018 | 0018 | 17f4 | 4e1c | 0000 | 0000 | 7e87 | 52c4 | 0000 | 0000 | 0013 | 0003 | 6976 | 6100 | 1798 | 0003 | 6130 |
| 4027540 | 3700 | 17e6 | 28c4 | 0018 | 0018 | 180c | 4e1c | 0000 | 0000 | 7e8f | 52c4 | 0000 | 0000 | 0013 | 28c4 | 0018 | 0018 | 182c | 4e1c | 0000 | 0000 | 7e97 | 52c4 | 0000 |

| | | | | | | | | | | | | | | | | | | | | | | | | |
|---|---|---|---|---|---|---|---|---|---|---|---|---|---|---|---|---|---|---|---|---|---|---|---|---|
| 4027620 | 0000 | 000b | 0003 | 6e72 | 3200 | 181e | 28c4 | 0018 | 0018 | 186c | 4e1c | 0000 | 0000 | 7e9f | 52c4 | 0000 | 0000 | 000b | 001a | 6465 | 6275 | 675f | 7365 | 7175 |
| 4027700 | 656e | 7469 | 616c | 5f73 | 7461 | 7465 | 6d65 | 6e74 | 0018 | 1798 | 0003 | 6e64 | 3200 | 185e | 28c4 | 0018 | 0018 | 188c | 4e1c | 0000 | 0000 | 7ea7 | 52c4 | 0000 |
| 4027760 | 0000 | 000b | 0003 | 6e64 | 3300 | 0697 | 28c4 | 0018 | 0018 | 18ac | 4e1c | 0000 | 0000 | 7eaf | 52c4 | 0000 | 0000 | 0013 | 0002 | 656e | 0000 | 0657 | 28c4 | 0018 |
| 4030040 | 0018 | 18cc | 4e1c | 0000 | 0000 | 7eb7 | 52c4 | 0000 | 0000 | 001b | 0002 | 656f | 0013 | 1ea1 | 28c4 | 0018 | 0018 | 18ec | 4e1c | 0000 | 0000 | 7ebf | 52c4 | 0000 |
| 4030120 | 0000 | 001b | 0004 | 656f | 6e31 | 0077 | 28c4 | 0018 | 0018 | 190c | 4e1c | 0000 | 0000 | 7ec7 | 52c4 | 0000 | 0000 | 001b | 0003 | 656f | 3100 | 3077 | 28c4 | 0018 |
| 4030200 | 0018 | 192c | 4e1c | 0000 | 0000 | 7ecf | 52c4 | 0000 | 0000 | 001b | 0003 | 6f72 | 3200 | 000f | 28c4 | 0018 | 0018 | 194c | 4e1c | 0000 | 0000 | 7ed7 | 52c4 | 0000 |
| 4030260 | 0000 | 0013 | 0003 | 6f72 | 3300 | 0013 | 28c4 | 0018 | 0018 | 196c | 4e1c | 0000 | 0000 | 7edf | 52c4 | 0000 | 0000 | 0013 | 0003 | 616f | 3200 | 0b3f | 28c4 | 0018 |
| 4030340 | 0018 | 198c | 4e1c | 0000 | 0000 | 7ee7 | 52c4 | 0000 | 0000 | 0013 | 0003 | 616f | 3300 | 08af | 2954 | 0018 | 0002 | 438a | 4e1c | 0000 | 0000 | 7eef | 52c4 | 0000 |
| 4030420 | 0000 | 0013 | 0018 | 1ac4 | 0000 | 002c | b288 | b66c | 0000 | 112b | 7fff | ffff | 0018 | 3c64 | 0200 | 0db5 | 0100 | 15ad | 0100 | 33fd | 0000 | 000b | 0000 | 315f |
| 4030500 | 003d | 2f68 | 6f6d | 652f | 6f73 | 6173 | 312f | 612f | 7669 | 6a61 | 792f | 5648 | 444c | 2f70 | 6172 | 7365 | 722f | 7072 | 6f6c | 6f67 | 2f6e | 6577 | 6e65 | 772f |
| 4030560 | 7633 | 2e31 | 2f73 | 6368 | 656d | 6174 | 6963 | 7300 | 0040 | 2f68 | 6f6d | 652f | 6f73 | 6173 | 312f | 612f | 7669 | 6a61 | 792f | 5648 | 444c | 2f70 | 6172 | 7365 |
| 4030640 | 722f | 7072 | 6f6c | 6f67 | 2f6e | 6577 | 6e65 | 772f | 7633 | 2e31 | 2f73 | 6368 | 656d | 6174 | 6963 | 732e | 706c | 005f | 0000 | 002c | 0018 | 1bd0 | b27c | b66c |
| 4030720 | 0000 | 112e | 7fff | ffff | 0017 | f598 | 0200 | 0db5 | 0200 | 2f35 | 0000 | 7f6f | 0000 | 0423 | 0000 | 315f | 0000 | 002c | 0018 | 3e7c | b27c | b66c | 0000 | 11b6 |
| 4031000 | 7fff | ffff | 0011 | 76fc | 0200 | 0db5 | 0200 | 224d | 0000 | 7f6f | 0000 | 3287 | 0000 | 315f | 000f | 6375 | 7272 | 656e | 745f | 7369 | 6374 | 7572 | 6500 | 0000 |
| 4031060 | 0018 | 1bf8 | 0000 | 002c | b27c | b66c | 0000 | 1130 | 0000 | 11b5 | 000a | d161 | 0200 | 0db5 | 0200 | 270d | 0000 | 7f6f | 0000 | 3287 | 0000 | 315f | 002b | 2f68 |
| 4031140 | 6f6d | 652f | 6f73 | 6173 | 322f | 622f | 7175 | 696e | 7475 | 732f | 7077 | 312e | 312f | 6c69 | 6272 | 6172 | 792f | 6f72 | 6465 | 7265 | 6400 | 0a09 | 002e | 2f68 |
| 4031220 | 6f6d | 652f | 6f73 | 6173 | 322f | 622f | 7175 | 696e | 7475 | 732f | 7077 | 312e | 312f | 6c69 | 6272 | 6172 | 792f | 6f72 | 6465 | 7265 | 642e | 706c | 0069 | 7665 |
| 4031300 | 0036 | 2f68 | 6f6d | 652f | 6f73 | 6173 | 322f | 622f | 7175 | 696e | 7475 | 732f | 6765 | 6e65 | 7269 | 632f | 7170 | 6c69 | 6232 | 2e35 | 2f6c | 6962 | 7261 | 7279 |
| 4031360 | 2f6f | 7264 | 6572 | 6564 | 0074 | 6174 | 0039 | 2f68 | 6f6d | 652f | 6f73 | 6173 | 322f | 622f | 7175 | 696e | 7475 | 732f | 6765 | 6e65 | 7269 | 632f | 7170 | 6c69 |
| 4031440 | 6232 | 2e35 | 2f6c | 6962 | 7261 | 7279 | 2f6f | 7264 | 6572 | 6564 | 2e70 | 6c00 | 0000 | 002c | 0018 | 3d10 | b27c | b66c | 0000 | 1133 | 7fff | ffff | 0018 | 1a5c |
| 4031520 | 0200 | 0db5 | 0200 | 2f35 | 0000 | 7f97 | 0000 | 042b | 0000 | 315f | 0018 | 22f8 | 0000 | 002c | b288 | b66c | 0000 | 1132 | 7fff | ffff | 0018 | 1bd0 | 0200 | 0db5 |
| 4031600 | 0100 | 15ad | 0100 | 33fd | 0000 | 000b | 0000 | 315f | 0000 | 0000 | 0000 | 0000 | 0000 | 0000 | 0016 | 4a5d | 0000 | 0000 | 000c | ae75 | 0000 | 0000 | 0016 | 8d51 |
| 4031660 | 0000 | 0000 | 0012 | c9ac | 0000 | 0000 | 0000 | 0000 | 0000 | 0000 | 0000 | 0000 | 0000 | 0000 | 0000 | 0000 | 0000 | 0000 | 0000 | 0000 | 000f | c2dc | 0000 | 0000 |
| 4031740 | 0000 | 0000 | 0000 | 0000 | 0000 | 0000 | 000f | c44c | 0000 | 0000 | 0014 | 8a74 | 0000 | 0000 | 000b | 1e00 | 0000 | 0000 | 0017 | a84d | 0000 | 0000 | 0017 | f164 |
| 4032020 | 000f | c6fc | 0000 | 0000 | 0000 | 0000 | 0000 | 0000 | 0017 | cbe1 | 0000 | 0000 | 0010 | d734 | 0000 | 0000 | 0015 | ba44 | 0000 | 0000 | 000e | 7a79 | 0000 | 0000 |
| 4032100 | 0000 | 0000 | 0000 | 0000 | 0000 | 0000 | 0018 | b7d4 | 0015 | b564 | 0019 | 9a21 | 0000 | 0000 | 0015 | b0f4 | 0018 | bb54 | 0000 | 0000 | 000a | 3859 | 0000 | 0000 |
| 4032160 | 0000 | 0000 | 0000 | 0000 | 0000 | 0000 | 000e | 83a8 | 0000 | 0000 | 000b | 3f74 | 0015 | bc9d | 000f | d180 | 0010 | a7c8 | 0000 | 0000 | 0016 | bd31 | 0000 | 0000 |
| 4032240 | 0000 | 0000 | 0000 | 0000 | 0012 | c390 | 000c | 1284 | 0000 | 0000 | 0000 | 0000 | 000b | 4228 | 000a | 33d1 | 000d | 6b58 | 0000 | 0000 | 0017 | f174 | 000c | 08e4 |
| 4032320 | 0019 | d4fc | 0000 | 0000 | 0000 | 0000 | 0000 | 0000 | 0000 | 0000 | 0000 | 0000 | 0011 | 699c | 0019 | d470 | 0000 | 0000 | 000a | 353d | 0011 | 4a70 | 0012 | c688 |
| 4032400 | 0011 | 37e4 | 000a | 3379 | 0010 | d704 | 001a | 4084 | 0017 | f261 | 0000 | 0000 | 000b | 8960 | 0000 | 0000 | 0000 | 0000 | 0011 | 682c | 0000 | 0000 | 0011 | 6538 |
| 4032460 | 0000 | 0000 | 0011 | 6548 | 0000 | 0000 | 0000 | 0000 | 000c | eb90 | 0018 | 3be4 | 0000 | 0000 | 0000 | 0000 | 000d | 785c | 0000 | 0000 | 000f | d05d | 0000 | 0000 |
| 4032540 | 000d | d31c | 0016 | 4ac4 | 0000 | 0000 | 0000 | 0000 | 0000 | 0000 | 0000 | 0000 | 0000 | 0000 | 0000 | 0000 | 0000 | 0000 | 0000 | 0000 | 0000 | 0000 | 000a | d05c |
| 4032620 | 0000 | 0034 | 0011 | 77c8 | b27c | b66c | 0000 | 113a | 7fff | ffff | 0018 | 1e5c | 0200 | 0db5 | 0400 | 242d | 0000 | 7f9f | 0000 | 0013 | 0000 | 7f77 | 0000 | 21cf |
| 4032700 | 0000 | 315f | 0000 | 0034 | 0018 | 1e28 | b27c | b66c | 0000 | 113b | 7fff | ffff | 0018 | 1e90 | 0200 | 0db5 | 0400 | 242d | 0000 | 6cd7 | 0000 | 0013 | 0000 | 7f77 |
| 4032760 | 0000 | 21cf | 0000 | 315f | 0000 | 0034 | 0018 | 1e5c | b27c | b66c | 0000 | 113c | 7fff | ffff | 0018 | 1ec4 | 0200 | 0db5 | 0400 | 242d | 0000 | 7f9f | 0000 | 001b |
| 4033040 | 0000 | 7f77 | 0000 | 21cf | 0000 | 315f | 0000 | 0034 | 0018 | 1e90 | b27c | b66c | 0000 | 113d | 7fff | ffff | 0018 | 1ef8 | 0200 | 0db5 | 0400 | 242d | 0000 | 6cd7 |
| 4033120 | 0000 | 001b | 0000 | 7f77 | 0000 | 21cf | 0000 | 315f | 0000 | 0034 | 0018 | 1ec4 | b27c | b66c | 0000 | 113e | 7fff | ffff | 0018 | 1f2c | 0200 | 0db5 | 0400 | 242d |
| 4033200 | 0000 | 778f | 0000 | 001b | 0000 | 7f77 | 0000 | 21cf | 0000 | 315f | 0000 | 0034 | 0018 | 1ef8 | b27c | b66c | 0000 | 113f | 7fff | ffff | 0018 | 1f60 | 0200 | 0db5 |
| 4033260 | 0400 | 242d | 0000 | 778f | 0000 | 0023 | 0000 | 7f77 | 0000 | 21cf | 0000 | 315f | 0000 | 0034 | 0018 | 1f2c | b27c | b66c | 0000 | 1140 | 7fff | ffff | 0018 | 1f94 |
| 4033340 | 0200 | 0db5 | 0400 | 242d | 0000 | 7fa7 | 0000 | 001b | 0000 | 7f77 | 0000 | 21cf | 0000 | 315f | 0000 | 0034 | 0018 | 1f60 | b27c | b66c | 0000 | 1141 | 7fff | ffff |
| 4033420 | 0018 | c1f0 | 0200 | 0db5 | 0400 | 242d | 0000 | 7fa7 | 0000 | 0023 | 0000 | 7f77 | 0000 | 21cf | 0000 | 315f | 0000 | 0034 | 000d | aa1c | b27c | b66c | 0000 | 1142 |
| 4033500 | 7fff | ffff | 0018 | 1ffc | 0200 | 0db5 | 0200 | 2855 | 0200 | 7f75 | 0000 | 0013 | 0000 | 0ab7 | 0000 | 7f77 | 0000 | 315f | 0000 | 0034 | 0018 | 1fc8 | b27c | b66c |
| 4033560 | 0000 | 1143 | 7fff | ffff | 0018 | 2030 | 0200 | 0db5 | 0200 | 2855 | 0200 | 7fad | 0000 | 0ab7 | 0000 | 0013 | 0000 | 7f77 | 0000 | 315f | 0000 | 0038 | 0018 | 1ffc |
| 4033640 | b27c | b66c | 0000 | 1144 | 7fff | ffff | 0018 | 2068 | 0200 | 0db5 | 0200 | 2855 | 0300 | 7fb5 | 0000 | 0ab7 | 0000 | 0ab7 | 0000 | 0013 | 0000 | 7f77 | 0000 | 315f |
| 4033720 | 0000 | 0038 | 0018 | 2030 | b27c | b66c | 0000 | 1145 | 7fff | ffff | 0018 | 20a0 | 0200 | 0db5 | 0200 | 2855 | 0300 | 7f9d | 0000 | 0013 | 0000 | 0ab7 | 0000 | 0e3f |
| 4034000 | 0000 | 7f77 | 0000 | 315f | 0000 | 003c | 0018 | 2068 | b27c | b66c | 0000 | 1146 | 7fff | ffff | 0018 | 20dc | 0200 | 0db5 | 0200 | 2855 | 0400 | 7fbd | 0000 | 0ab7 |
| 4034060 | 0000 | 0ab7 | 0000 | 0e3f | 0000 | 0013 | 0000 | 7f77 | 0000 | 315f | 0000 | 0038 | 0018 | 20a0 | b27c | b66c | 0000 | 1147 | 7fff | ffff | 0018 | 2114 | 0200 | 0db5 |
| 4034140 | 0200 | 2855 | 0300 | 6cd5 | 0000 | 0013 | 0000 | 0ab7 | 0000 | 0e3f | 0000 | 7f77 | 0000 | 315f | 0000 | 003c | 0018 | 20dc | b27c | b66c | 0000 | 1148 | 7fff | ffff |
| 4034220 | 0018 | 2150 | 0200 | 0db5 | 0200 | 2855 | 0400 | 7fc5 | 0000 | 0ab7 | 0000 | 0ab7 | 0000 | 0e3f | 0000 | 0013 | 0000 | 7f77 | 0000 | 315f | 0000 | 003c | 0018 | 2114 |
| 4034300 | b27c | b66c | 0000 | 1149 | 7fff | ffff | 0018 | 218c | 0200 | 0db5 | 0200 | 2855 | 0400 | 7fa5 | 0000 | 0013 | 0000 | 0e3f | 0000 | 0ab7 | 0000 | 0e3f | 0000 | 7f77 |
| 4034360 | 0000 | 315f | 0000 | 003c | 0018 | 2150 | b27c | b66c | 0000 | 114a | 7fff | ffff | 0018 | 21c8 | 0200 | 0db5 | 0200 | 2855 | 0400 | 7fcd | 0000 | 0ab7 | 0000 | 0e3f |
| 4034440 | 0000 | 0013 | 0000 | 0e3f | 0000 | 7f77 | 0000 | 315f | 0000 | 0044 | 0018 | 218c | b27c | b66c | 0000 | 114b | 7fff | ffff | 0018 | 220c | 0200 | 0db5 | 0200 | 2855 |
| 4034520 | 0600 | 7fcd | 0000 | 0ab7 | 0000 | 0e3f | 0000 | 0ab7 | 0000 | 0013 | 0000 | 0ad7 | 0000 | 0e3f | 0000 | 7f77 | 0000 | 315f | 0000 | 003c | 0018 | 21c8 | b27c | b66c |
| 4034600 | 0000 | 114c | 7fff | ffff | 0018 | 2248 | 0200 | 0db5 | 0200 | 2855 | 0400 | 778d | 0000 | 0013 | 0000 | 0e3f | 0000 | 0ab7 | 0000 | 0e3f | 0000 | 7f77 | 0000 | 315f |
| 4034660 | 0000 | 003c | 0018 | 220c | b27c | b66c | 0000 | 114d | 7fff | ffff | 0018 | 2284 | 0200 | 0db5 | 0200 | 2855 | 0400 | 7fd5 | 0000 | 0ab7 | 0000 | 0e3f | 0000 | 0013 |

```
4034740  0000 0e3f 0000 7f77 0000 315f 0000 0044 0018 2248 b27c b66c 0000 114e 7fff ffff 0018 c328 0200 0db5 0200 2855 0600 7fd5
4035020  0000 0ab7 0000 0e3f 0000 0ab7 0000 0013 0000 0ad7 0000 0e3f 0000 7f77 0000 315f 0000 0034 0016 5304 b27c b66c 0000 1150
4035100  7fff ffff 0007 a695 0200 0db5 0400 24ad 0000 1ea7 0000 001b 0000 7f77 0000 1ea7 0000 315f 0018 275c 0060 0438 b288 b66c
4035160  0000 114f 7fff ffff 0018 22c8 0200 0db5 0100 15ad 0100 33fd 0200 0b3d 0000 1ea7 0000 0013 0000 315f 0018 2360 0000 0034
4035240  b288 b66c 0000 114f 7fff ffff 0018 22fc 0200 0db5 0100 15ad 0100 33fd 0200 0b3d 0000 1ea7 0000 001b 0000 315f 0018 2394
4035320  0000 0034 b288 b66c 0000 114f 7fff ffff 0018 2330 0200 0db5 0100 15ad 0100 33fd 0200 0b3d 0000 1ea7 0000 0023 0000 315f
4035400  0018 23c8 0000 0034 b288 b66c 0000 114f 7fff ffff 0018 2364 0200 0db5 0100 15ad 0100 33fd 0200 0b3d 0000 1ea7 0000 002b
4035460  0000 315f 0018 23fc 0000 0034 b288 b66c 0000 114f 7fff ffff 0018 2398 0200 0db5 0100 15ad 0100 33fd 0200 0b3d 0000 1ea7
4035540  0000 0033 0000 315f 0018 2430 0000 0034 b288 b66c 0000 114f 7fff ffff 0018 23cc 0200 0db5 0100 15ad 0100 33fd 0200 0b3d
4035620  0000 1ea7 0000 003b 0000 315f 0018 2464 0000 0034 b288 b66c 0000 114f 7fff ffff 0018 2400 0200 0db5 0100 15ad 0100 33fd
4035700  0200 0b3d 0000 2fe7 0000 0023 0000 315f 0018 249c 0000 0038 b27c b66c 0000 1151 0000 1170 0018 24cc 0200 0db5 0500 1cdd
4035760  0000 2def 0000 000b 0000 7f77 00c4 fe63 0000 042b 0000 315f 0018 24c8 0000 002c b4f0 b4e4 0000 1150 7fff ffff 0008 b0dd
4036040  0000 0000 0000 0000 0018 2c6c 0002 438a 0018 ae08 0018 2500 0000 0038 b27c b66c 0000 1153 0000 1171 0018 2504 0200 0db5
4036120  0500 1cdd 0000 7f77 0000 000b 0000 7f77 00c1 d323 0000 042b 0000 315f 0018 2538 0000 0038 b27c b66c 0000 1154 0000 1172
4036200  0018 253c 0200 0db5 0500 1cdd 0000 7fb7 0000 0013 0000 7f77 00c5 0523 0000 042b 0000 315f 0018 2570 0000 0038 b27c b66c
4036260  0000 1155 0000 1173 0018 2574 0200 0db5 0500 1cdd 0000 7f77 0000 0013 0000 7f77 00c3 e523 0000 042b 0000 315f 0018 25a8
4036340  0000 0038 b27c b66c 0000 1156 0000 1174 0018 25ac 0200 0db5 0500 1cdd 0000 7faf 0000 0013 0000 7f77 00c5 0a03 0000 042b
4036420  0000 315f 0018 25e0 0000 0038 b27c b66c 0000 1157 0000 1175 0018 25e4 0200 0db5 0500 1cdd 0000 7fb7 0000 001b 0000 7f77
4036500  00c5 0ea3 0000 042b 0000 315f 0018 2618 0000 0038 b27c b66c 0000 1158 0000 1176 0018 261c 0200 0db5 0500 1cdd 0000 7f9f
4036560  0000 0013 0000 7f77 00c3 e623 0000 042b 0000 315f 0018 2650 0000 0038 b27c b66c 0000 1159 0000 1177 0018 2654 0200 0db5
4036640  0500 1cdd 0000 7fbf 0000 001b 0000 7f77 00c5 1523 0000 042b 0000 315f 0018 2688 0000 0038 b27c b66c 0000 115a 0000 1178
4036720  0018 268c 0200 0db5 0500 1cdd 0000 6cd7 0000 0013 0000 7f77 00c3 e7a3 0000 042b 0000 315f 0018 26c0 0000 0038 b27c b66c
4037000  0000 115b 0000 1179 0018 26c4 0200 0db5 0500 1cdd 0000 7fc7 0000 001b 0000 7f77 00c5 1bc3 0000 042b 0000 315f 0018 26f8
4037060  0000 0038 b27c b66c 0000 115c 0000 117a 0018 26fc 0200 0db5 0500 1cdd 0000 7f9f 0000 001b 0000 7f77 00c3 e923 0000 042b
4037140  0000 315f 0018 275c 0000 0038 b27c b66c 0000 115d 0000 117b 0018 2760 0200 0db5 0500 1cdd 0000 7fbf 0000 0023 0000 7f77
4037220  00c5 2343 0000 042b 0000 315f 28c4 002c 0018 a4c0 56f8 671c 682c 46ec 4768 47e4 3858 35c8 3c48 0000 0008 b6dc 001c 2ecc
4037300  23e4 0000 0018 a468 0018 27f8 0000 0070 b27c b66c 0000 115e 0000 117c 0018 2798 0200 0db5 0500 1cdd 0000 6cd7 0000 001b
4037360  0000 7f77 00c3 ea23 0000 042b 0000 315f 0018 27f8 0000 0038 b27c b66c 0000 115f 0000 117d 0018 27fc 0200 0db5 0500 1cdd
4037440  0000 7fc7 0000 0023 0000 7f77 00c5 2983 0000 042b 0000 315f 28c4 002c 0018 a588 56f8 671c 682c 46ec 4768 47e4 362c 37f0
4037520  3c48 0000 0008 b6dc 001c 2ecc 23e4 0000 0018 a530 0018 28e8 0000 00b0 b27c b66c 0000 1160 0000 117e 0018 2874 0200 0db5
4037600  0500 1cdd 0000 7fa7 0000 001b 0000 7f77 00c3 ee03 0000 042b 0000 315f 0018 2870 0000 0040 0000 0000 0000 0000 0018 a5c8
4037660  0000 0000 0000 0000 0000 0000 0018 a388 0018 a71c 0018 a169 0000 0000 0018 a5f0 0018 a858 0000 0000 0000 0000 0018 28e8
4037740  0000 0038 b27c b66c 0000 1161 0000 117f 0018 29ec 0200 0db5 0500 1cdd 0000 7fe7 0000 001b 0000 7f77 00c5 1363 0000 042b
4040020  0000 315f 27f0 0040 0018 a648 56f8 66c0 0020 001c 2520 4768 34e0 0018 3430 3678 0020 4538 6c84 0020 6c84 001c 24d0 0000
4040100  0018 a610 0018 2ecc 386c 3d30 3cf4 234c 0018 a26c 0018 2958 0000 0038 b27c b66c 0000 1162 0000 1180 0018 295c 0200 0db5
4040160  0500 1cdd 0000 7fe7 0000 002b 0000 7f77 00c5 3083 0000 042b 0000 315f 28c4 0038 0018 a6bc 56f8 671c 682c 5758 6b74 6a00
4040240  4768 47e4 4880 0018 001c 35c8 379c 8d94 aab4 0000 a538 2ecc 3984 0018 001c 2304 0018 a610 0018 2a10 0000 0070 b27c b66c
4040320  0000 1163 0000 1181 0018 2994 0200 0db5 0500 1cdd 0000 7fa7 0000 0023 0000 7f77 00c3 ef83 0000 042b 0000 315f 0018 2a10
4040400  0000 0038 b27c b66c 0000 1164 0000 1182 0018 2a14 0200 0db5 0500 1cdd 0000 7fcf 0000 0023 0000 7f77 00c5 3863 0000 042b
4040460  0000 315f 27f0 0048 0018 a774 56f8 66c0 0024 0020 2520 4768 47e4 34e0 001c 34c0 0018 38d4 3678 0024 4538 6c84 0024 6c84
4040540  0020 247c 0018 a73c 001c 2ecc 38e8 386c 3d30 3cf4 242c 0000 0018 a70c 0018 2a90 0000 0038 b27c b66c 0000 1165 0000 1183
4040620  0018 2a94 0200 0db5 0500 1cdd 0000 7fcf 0000 0033 0000 7f77 00c5 39e3 0000 042b 0000 315f 28c4 0048 0018 a7ec 56f8 671c
4040700  682c 5758 6b74 6a00 4768 47e4 4880 0018 001c 4880 001c 0020 362c 3804 3c48 0000 0008 b6dc 0024 2ecc 3984 001c 0020 3984
4040760  0018 001c 23e4 0000 0018 a73c 0018 2b40 0000 0070 b27c b66c 0000 1166 0000 1184 0018 2acc 0200 0db5 0500 1cdd 0000 778f
4041040  0000 001b 0000 7f77 00c3 eb23 0000 042b 0000 315f 0018 2b40 0000 0038 b27c b66c 0000 1167 0000 1185 0018 2b44 0200 0db5
4041120  0500 1cdd 0000 7fef 0000 001b 0000 7f77 00c5 4243 0000 042b 0000 315f 27f0 0040 0018 a8b0 56f8 66c0 0020 001c 2520 4768
4041200  34e0 0018 3430 3678 0020 4538 6c84 0020 6c84 001c 24d0 0000 0018 a878 0018 2ecc 386c 3d30 3cf4 234c 0018 a848 0018 2bb0
4041260  0000 0038 b27c b66c 0000 1168 0000 1186 0018 2bb4 0200 0db5 0500 1cdd 0000 7fef 0000 002b 0000 7f77 00c5 43c3 0000 042b
4041340  0000 315f 28c4 0038 0018 a924 56f8 671c 682c 5758 6b74 6a00 4768 47e4 4880 0018 001c 3804 8d94 aab4 0000 a538 2ecc 3984
4041420  0018 001c 23e4 0000 0018 a878 0018 2c68 0000 0070 b27c b66c 0000 1169 0000 1187 0018 2bec 0200 0db5 0500 1cdd 0000 778f
4041500  0000 0023 0000 7f77 00c3 eca3 0000 042b 0000 315f 0018 2c68 0000 0038 b27c b66c 0000 116a 0000 1188 0018 2c6c 0200 0db5
4041560  0500 1cdd 0000 7fd7 0000 0023 0000 7f77 00c5 4ba3 0000 042b 0000 315f 27f0 0048 0018 a9dc 56f8 66c0 0024 0020 2520 4768
4041640  47e4 34e0 001c 34c0 0018 38d4 3678 0024 4538 6c84 0024 6c84 0020 247c 0018 a9a4 001c 2ecc 38e8 386c 3d30 3cf4 242c 0000
4041720  0018 a974 0018 2ce8 0000 0038 b130 b66c 0000 116b 0000 1189 0018 24a1 0200 0db5 0500 1cdd 0000 7fd7 0000 0033 0000 7f77
4042000  00c5 4d23 0000 042b 0000 315f 28c4 0048 0018 aa54 56f8 671c 682c 5758 6b74 6a00 4768 47e4 4880 0018 001c 4880 001c 0020
```

```
4042060  386c 35c8 3c48 0000 0008 b6dc 0024 2ecc 3984 001c 0020 3984 0018 001c 23e4 0000 0018 a9a4 0018 3c60 0000 0cc8 7265 615d
4042140  292e 0a69 6e66 6f5f 6672 6f6d 5f64 6174 6128 7379 6e6f 7073 7973 2c20 746f 7461 6c5f 6172 6561 2c20 4172 6561 2c20 5b27
4042220  546f 7461 6c27 2c20 2761 7265 613a 272c 2041 7265 615d 292e 0a69 6e66 6f5f 6672 6f6d 5f64 6174 6128 7379 6e6f 7073 7973
4042300  2c20 706f 7274 732c 204e 756d 6265 722c 205b 2770 6f72 7473 3a27 2c20 4e75 6d62 6572 5d29 2e0a 696e 666f 5f66 726f 6d5f
4042360  6461 7461 2873 796e 6f70 7379 732c 206e 6574 732c 204e 7561 6265 722c 205b 276e 6574 733a 272c 204e 756d 6265 725d 292e
4042440  0a69 6e66 6f5f 6672 6f6d 5f64 6174 6128 7379 6e6f 7073 7973 2c20 7265 706f 7274 2c20 5479 7065 2c20 5b27 5265 706f 7274
4042520  272c 2027 3a27 2c20 5479 7065 5d29 2e0a 696e 666f 5f66 726f 6d5f 6461 7461 2873 796e 6f70 7379 732c 2064 6573 6967 6e2c
4042600  204e 616d 652c 205b 2744 6573 6967 6e27 2c20 273a 272c 204e 616d 655d 292e 0a0a 2525 2525 2066 6f72 2064 7370 0a69 6e66
4042660  6f5f 6672 6f6d 5f64 6174 6128 6473 702c 2062 7573 6573 2c20 4e75 6d62 6572 2c20 5b27 4255 5345 5327 2c20 4e75 6d62 6572
4042740  5d29 2e0a 696e 666f 5f66 726f 6d5f 6461 7461 2864 7370 2c20 6d75 7865 732c 204e 756d 6265 722c 205b 274d 554c 5449 504c
4043020  4558 4552 5327 2c20 4e75 6d62 6572 5d29 2e0a 696e 666f 5f66 726f 6d5f 6461 7461 2864 7370 2c20 6175 785f 696e 7075 7473
4043100  2c20 4e75 6d62 6572 2c20 5b27 4d55 4c54 4950 4c45 5845 5227 2c20 2749 4e50 5554 5327 2c20 4e75 6d62 6572 5d29 2e0a 696e
4043160  666f 5f66 726f 6d5f 6461 7461 2864 7370 2c20 7265 6769 7374 6572 732c 204e 756d 6265 722c 205b 2752 4547 4953 5445 5253
4043240  3a27 2c20 2754 4f54 414c 272c 204e 756d 6265 725d 292e 0a69 6e66 6f5f 6672 6f6d 5f64 6174 6128 6473 702c 2063 6f6e 6e65
4043320  6374 696f 6e73 2c20 4e75 6d62 6572 2c20 5b27 434f 4e4e 4543 5449 4f4e 5327 2c20 4e75 6d62 6572 5d29 2e0a 0a25 2525 2520
4043400  666f 7220 6c76 6572 0a69 6e66 6f5f 6672 6f6d 5f64 6174 6128 6c76 6572 2c20 6761 7465 735f 7573 6564 2c20 4e75 6d62 6572
4043460  2c20 5b27 4741 5445 5327 2c20 2755 5345 443a 272c 204e 7561 6265 725d 292e 0a69 6e66 6f5f 6672 6f6d 5f64 6174 6128 6c76
4043540  6572 2c20 6176 6572 6167 655f 7069 6e73 5f70 6572 5f6e 6574 2c20 4e75 6d62 6572 2c0a 095b 2741 5645 5241 4745 272c 2027
4043620  5049 4e53 272c 2027 5045 5227 2c20 274e 4554 3a27 2c20 4e75 6d62 6572 5d29 2e0a 696e 666f 5f66 726f 6d5f 6461 7461 286c
4043700  7665 722c 206d 6178 5f70 696e 735f 7065 725f 6e65 742c 204e 756d 6265 722c 0a09 5b27 4d41 5849 4d55 4d27 2c20 2750 494e
4043760  5327 2c20 2750 4552 272c 2027 4e45 543a 272c 204e 756d 6265 725d 292e 0a69 6e66 6f5f 6672 6f6d 5f64 6174 6128 6c76 6572
4044040  2c20 696e 7075 745f 7069 6e73 2c20 4e75 6d62 6572 2c0a 095b 2749 4e50 5554 272c 2027 5049 4e53 272c 2027 2845 5843 4c55
4044120  4449 4e47 272c 2742 4944 4952 4543 5449 4f4e 414c 272c 2750 494e 5329 3a27 2c5f 2c4e 756d 6265 725d 292e 0a69 6e66 6f5f
4044200  6672 6f6d 5f64 6174 6128 6c76 6572 2c20 6f75 7470 7574 5f70 696e 732c 204e 756d 6265 722c 0a09 5b27 4f55 5450 5554 272c
4044260  2027 5049 4e53 272c 2027 2845 5843 4c55 4449 4e47 272c 2742 4944 4952 4543 5449 4f4e 414c 272c 2750 494e 5329 3a27 2c5f
4044340  2c4e 756d 6265 725d 292e 0a69 6e66 6f5f 6672 6f6d 5f64 6174 6128 6c76 6572 2c20 6269 6469 7265 6374 696f 6e61 6c5f 7069
4044420  6e73 2c20 4e75 6d62 6572 2c0a 095b 2742 4944 4952 4543 5449 4f4e 414c 272c 2027 5049 4e53 3a27 2c20 5f2c 204e 756d 6265
4044500  725d 292e 0a25 696e 666f 5f66 726f 6d5f 6461 7461 286c 7665 722c 2070 6164 5f6c 6f63 6174 696f 6e73 2c20 4e75 6d62 6572
4044560  2c0a 2509 5b27 5041 4427 2c27 4c4f 4341 5449 4f4e 5327 2c27 5553 4544 272c 2746 4f52 272c 2742 4944 4952 4543 5449 4f4e
4044640  414c 272c 2750 494e 533a 272c 205f 2c20 4e75 6d62 6572 5d29 2e0a 2525 2525 2525 2525 2525 2525 2525 2525 2525 2525 2525
4044720  2525 2525 2525 2525 2525 2525 2525 2525 2525 2525 2525 2525 2525 2525 2525 2525 2525 2525 2525 2525 2525 2525 2525 2525
4045000  2525 2525 2525 2525 0a00 08af 0000 0a23 0018 3299 0018 32b6 0200 08af 0000 1173 0018 2761 0018 32a9 0018 32c6 0100 08af
4045060  0000 1033 0018 32bd 0018 32d6 0100 08af 0000 0a13 0018 32cd 0018 32ea 0200 08af 0000 1173 0018 27bd 0018 32dd 0018 32fa
4045140  0100 08af 0000 1043 0018 32f1 0018 330a 0100 08af 0000 0a23 0018 3301 0018 331e 0200 08af 0000 1173 0018 2819 0018 3311
4045220  0018 332e 0100 08af 0000 1033 0018 3325 0018 333e 0100 08af 0000 0a13 0018 3335 0018 3352 0200 08af 0000 1173 0018 2875
4045300  0018 3345 0018 3362 0100 08af 0000 1043 0018 3359 0018 3372 0100 08af 0000 0a23 0018 3369 0018 3386 0200 08af 0000 1173
4045360  0018 28d1 0018 3379 0018 3396 0100 08af 0000 1033 0018 338d 0018 33a6 0100 08af 0000 0a13 0018 339d 0018 33ba 0200 08af
4045440  0000 1173 0018 292d 0018 33ad 0018 33ca 0100 08af 0000 1043 0018 33c1 0018 33da 0100 08af 0000 0a23 0018 33d1 0018 33ee
4045520  0200 08af 0000 1173 0018 2989 0018 33e1 0018 33fe 0100 08af 0000 1033 0018 33f5 0018 340e 0100 08af 0000 0a13 0018 3405
4045600  0018 3422 0200 08af 0000 1173 0018 29e5 0018 3415 0018 3432 0100 08af 0000 1043 0018 3429 0018 3442 0100 08af 0000 0a23
4045660  0018 3439 0018 3456 0200 08af 0000 1173 0018 2a41 0018 3449 0018 3466 0100 08af 0000 1033 0018 345d 0018 3476 0100 08af
4045740  0000 0a13 0018 346d 0018 348a 0200 08af 0000 1173 0018 2a9d 0018 347d 0018 349a 0100 08af 0000 1043 0018 3491 0018 34aa
4046020  0100 08af 0000 0a23 0018 34a1 0018 34be 0200 08af 0000 1173 0018 2af9 0018 34b1 0018 34ce 0100 08af 0000 1033 0018 34c5
4046100  0018 34de 0100 08af 0000 0a13 0018 34d5 0018 34f2 0200 08af 0000 1173 0018 2b55 0018 34e5 0018 3502 0100 08af 0000 1043
4046160  0018 34f9 0018 3512 0100 08af 0000 0a23 0018 3509 0018 3526 0200 08af 0000 1173 0018 2bb1 0018 3519 0018 3536 0100 08af
4046240  0000 1033 0018 352d 0018 3546 0100 08af 0000 0a13 0018 353d 0018 355a 0200 08af 0000 1173 0018 2c0d 0018 354d 0018 356a
4046320  0100 08af 0000 1043 0018 3561 0018 357a 0100 08af 0000 0a23 0018 3571 0018 358e 0200 08af 0000 1173 0018 2c69 0018 3581
4046400  0018 359e 0100 08af 0000 1033 0018 3595 0018 35ae 0100 08af 0000 0a13 0018 35a5 0018 35c2 0200 08af 0000 1173 0018 2ca5
4046460  0018 35b5 0018 35d2 0100 08af 0000 1043 0018 35c9 0018 35e6 0200 08af 0000 0043 0012 fc9d 0018 35d9 0018 35f6 0100 2627
4046540  0012 fb80 0018 35ed 0018 361e 0200 08af 0000 0193 0013 0d11 0200 0ad7 0013 0d1c 0013 0d20 0100 2d47 0018 3609 0018 35fd
4046620  0018 362e 0100 08af 0000 0613 0018 3625 0018 3646 0300 08af 0000 0743 0013 0d75 0017 52b5 0018 3635 0018 3656 0100 08af
4046700  0000 00e3 0018 364d 0018 3666 0100 08af 0000 0a23 0018 365d 0018 367a 0200 08af 0000 1173 0018 1959 0018 366d 0018 368a
4046760  0100 08af 0000 1183 0018 3681 0018 369a 0100 08af 0000 0a13 0018,3691 0018 36ae 0200 08af 0000 1173 0018 19a9 0018 36a1
4047040  0018 36be 0100 08af 0000 1043 0018 36b5 0018 36ce 0100 08af 0000 0a23 0018 36c5 0018 36e2 0200 08af 0000 1173 0018 1a05
4047120  0018 36d5 0018 36f2 0100 08af 0000 1033 0018 36e9 0018 3702 0100 08af 0000 0a13 0018 36f9 0018 3716 0200 08af 0000 1173
```

```
4047200  0018 1a61 0018 3709 0018 3726 0100 08af 0000 1043 0018 371d 0018 3736 0100 08af 0000 0a23 0018 3724 0018 374a 0200 08af
4047260  0000 1173 0018 1abd 0018 373d 0018 375a 0100 08af 0000 1033 0018 3751 0018 376a 0100 08af 0000 0a13 0018 3761 0018 377e
4047340  0200 08af 0000 1173 0018 1b19 0018 3771 0018 378e 0100 08af 0000 1043 0018 3785 0018 379e 0100 08af 0000 0a23 0018 3795
4047420  0018 37b2 0200 08af 0000 1173 0018 1b75 0018 37a5 0018 37c2 0100 08af 0000 1033 0018 37b9 0018 37d2 0100 08af 0000 0a13
4047500  0018 37c9 0018 37e6 0200 08af 0000 1173 0018 1bd1 0018 37d9 0018 37f6 0100 08af 0000 1043 0018 37ed 0018 3806 0100 08af
4047560  0000 0a23 0018 37fd 0018 381a 0200 08af 0000 1173 0018 1c2d 0018 380d 0018 382a 0100 08af 0000 1033 0018 3821 0018 383a
4047640  0100 08af 0000 0a13 0018 3831 0018 384e 0200 08af 0000 1173 0018 1c89 0018 3841 0018 385e 0100 08af 0000 1043 0018 3855
4047720  0018 386e 0100 08af 0000 0a23 0018 3865 0018 3882 0200 08af 0000 1173 0018 1ce5 0018 3875 0018 3892 0100 08af 0000 1033
4050000  0018 3889 0018 38a2 0100 08af 0000 0a13 0018 3899 0018 38b6 0200 08af 0000 1173 0018 1d41 0018 38a9 0018 38c6 0100 08af
4050060  0000 1043 0018 38bd 0018 38d6 0100 08af 0000 0a23 0018 38cd 0018 38ea 0200 08af 0000 1173 0018 1d9d 0018 38dd 0018 38fa
4050140  0100 08af 0000 1033 0018 38f1 0018 390a 0100 08af 0000 0a13 0018 3901 0018 391e 0200 08af 0000 1173 0018 1df9 0018 3911
4050220  0018 392e 0100 08af 0000 1043 0018 3925 0018 393e 0100 08af 0000 0a23 0018 3935 0018 3952 0200 08af 0000 1173 0018 1e55
4050300  0018 3945 0018 3962 0100 08af 0000 1033 0018 3959 0018 3972 0100 08af 0000 0a13 0018 3969 0018 3986 0200 08af 0000 1173
4050360  0018 1eb1 0018 3979 0018 3996 0100 08af 0000 1043 0018 398d 0018 39a6 0100 08af 0000 0a23 0018 399d 0018 39ba 0000 7f07
4050440  b328 f598 0017 f5c8 0000 0000 0018 39ac 000b 1c98 0015 3c2c 0000 7f0f 0000 3287 0000 0000 0017 f68c 0017 f68c 0001 0083
4050520  0000 0000 0000 7f97 b328 3b14 0011 7700 0000 0000 000c 6465 6275 675f 656e 7469 7479 000e 0015 3c5c 0000 7f17 0000 3287
4050600  0000 0000 0017 f7ec 0017 f7ec 0001 0083 0000 0000 2c78 0010 0002 438a 239c 0000 0018 3ba4 000e 6d98 0000 0000 0012 6465
4050660  6275 675f 6172 6368 6974 6563 7475 7265 0018 2021 0015 3cbc 0000 7f1f 0000 3287 0000 0000 0017 f88c 0017 f88c 0001 0083
4050740  0000 0000 0000 7f97 b328 3a8a 0018 1bd4 0000 0000 000a 6d61 785f 6d65 6d62 6572 0000 0000 0017 6465 6275 675f 7072 6f63
4051020  6573 735f 7374 6174 656d 656e 7400 3abe 001e 6465 6275 675f 7072 6f63 6573 735f 6465 636c 6172 6174 6976 655f 7061 7274
4051100  0018 3ae2 001c 6465 6275 675f 7372 6f63 6573 735f 7374 6174 656d 656e 745f 7061 7274 00e9 0015 3d1c 0000 7f27 0000 3287
4051160  0000 0000 0017 f92c 0017 f92c 0001 0083 0000 0000 0000 7f6f b328 3c44 0018 1a8c 0000 0000 0014 85d4 0000 7f2f 0000 3287
4051240  0000 0000 0017 f99c 0017 f99c 0001 0083 0000 0000 0014 84b4 0000 7f37 0000 3287 0000 0000 0018 3bb4 0018 3bb4 0001 0083
4051320  0000 0000 001d 6173 7365 7274 6462 5f76 6172 6961 626c 655f 6465 636c 6172 6174 696f 6e00 000a 7365 6c65 6374 5f6d 696e
4051400  0000 0000 0014 7e48 0100 7f77 0000 7f77 0000 0004 0018 a070 0018 a070 0001 0085 0000 0000 2c78 0010 0002 438a 239c 0000
4051460  0018 39d4 0014 80dc 0000 7f47 0000 3287 0000 0000 0018 3bf4 0018 3bf4 0001 0083 0000 0000 0000 7f6f b328 1033 0018 1a60
4051540  000c 0000 2c78 0020 0002 438a 2520 247c 0018 3a14 000c 247c 0018 3a64 000c 234c 0018 3b04 000b 6465 6275 675f 7574 696c
4051620  7300 3c19 0014 87bc 0000 7f4f 0000 3287 0000 0000 0017 fa8c 0017 fa8c 0001 0083 0000 0000 000a 7363 6865 6d61 7469 6373
4051700  0000 0000 0018 7c74 0018 3a34 0018 3d78 0000 002c b288 b66c 0000 11df 7fff ffff 0018 be5c 0200 0db5 0100 15ad 0100 33fd
4051760  0000 000b 0000 315f 003a 2f68 6f6d 652f 6f73 6173 312f 612f 7669 6a61 792f 5648 444c 2f70 6172 7365 722f 7072 6f6c 6f67
4052040  2f6e 6577 6e65 772f 7633 2e31 2f6f 626a 6563 7473 0068 6520 003d 2f68 6f6d 652f 6f73 6173 312f 612f 7669 6a61 792f 5648
4052120  444c 2f70 6172 7365 722f 7072 6f6c 6f67 2f6e 6577 6e65 772f 7633 2e31 2f6f 626a 6563 7473 2e70 6c00 0000 002c 0018 3e24
4052200  b27c b66c 0000 11e2 7fff ffff 0018 1bd0 0200 0db5 0200 2f35 0000 818f 0000 0433 0000 315f 0000 002c 0018 c158 b27c b66c
4052260  0000 1247 7fff ffff 0018 3e7c 0200 0db5 0200 224d 0000 818f 0000 3287 0000 315f 2c78 0012 0002 438a 4e1c 0000 0000 85ef
4052340  228c 0000 0018 3e4c 0000 002c b27c b66c 0000 11e4 0000 1246 000a d16d 0200 0db5 0200 270d 0000 818f 0000 3287 0000 315f
4052420  0037 2f68 6f6d 652f 6f73 6173 312f 612f 7669 6a61 792f 5648 444c 2f70 6172 7365 722f 7072 6f6c 6f67 2f6e 6577 6e65 772f
4052500  7633 2e31 2f63 6466 6700 735d 003a 2f68 6f64 652f 6f73 6173 312f 612f 7669 6a61 792f 5648 444c 2f70 6172 7365 722f 7072
4052560  6f6c 6f67 2f6e 6577 6e65 772f 7633 2e31 2f63 6466 672e 706c 0077 7329 0000 002c 0018 bf84 b27c b66c 0000 11e7 7fff ffff
4052640  0018 3d10 0200 0db5 0200 2f35 0000 81a7 0000 043b 0000 315f 0018 3eb8 0000 002c b298 b66c 0000 11e6 7fff ffff 0018 3e24
4052720  0200 0db5 0100 15ad 0100 33fd 0000 000b 0000 315f 0000 002c 0018 3d3c b27c b66c 0000 120e 7fff ffff 0018 1a88 0200 0db5
4053000  0200 224d 0000 81a7 0000 3287 0000 315f 0011 4845 4c50 3a20 7668 646c 5f73 6f75 7263 6500 0018 4060 0000 0170 b27c b66c
4053060  0000 11e9 0000 120d 000a d16d 0200 0db5 0200 270d 0000 81a7 0000 3287 0000 315f 0018 3f1c 0000 0038 b27c b66c 0000 11ea
4053140  0000 120f 0018 3f4c 0200 0db5 0500 1cdd 0000 81af 0000 000b 0000 3287 00c8 f3e3 0000 043b 0000 315f 0018 3f48 0000 002c
4053220  b4f0 b4e4 0000 11e9 7fff ffff 0008 b0dd 0000 0000 0000 0000 0018 5490 0002 438a 0019 2698 0018 3f80 0000 0038 b27c b66c
4053300  0000 11eb 0000 1210 0018 3f84 0200 0db5 0500 1cdd 0000 80f7 0000 0013 0000 3287 00c8 f4e3 0000 043b 0000 315f 0018 3fb8
4053360  0000 0038 b27c b66c 0000 11ec 0000 1211 0018 3fbc 0200 0db5 0500 1cdd 0000 81b7 0000 000b 0000 3287 00c8 f5e3 0000 043b
4053440  0000 315f 0018 3ffc 0000 0038 b27c b66c 0000 11ed 0000 1212 0018 3ff4 0200 0db5 0500 1cdd 0000 767f 0000 0023 0000 3287
4053520  00c8 f6e3 0000 043b 0000 315f 0018 4060 0000 0038 b27c b66c 0000 11ee 0000 1213 0018 4064 0200 0db5 0500 1cdd 0000 81bf
4053600  0000 000b 0000 3287 00c8 f8a3 0000 043b 0000 315f 2c78 0038 0002 438a 35c8 442c 0200 3d5f 4b8c 0000 0000 1e53 4b8c 0000
4053660  0000 1903 3640 43c0 0100 0e4f 4b8c 0000 0000 803f 239c 0000 0019 1f54 0018 418c 0000 00a8 b27c b66c 0000 11ef 0000 1214
4053740  0018 409c 0200 0db5 0500 1cdd 0000 81bf 0000 0013 0000 3287 00c8 fba3 0000 043b 0000 315f 0018 40d0 0000 0038 b27c b66c
4054020  0000 11f0 0000 1215 0018 40d4 0200 0db5 0500 1cdd 0000 81bf 0000 0023 0000 3287 00c8 faa3 0000 043b 0000 315f 0018 418c
4054100  0000 0038 b27c b66c 0000 11f1 0000 1216 0018 4190 0200 0db5 0500 1cdd 0000 81bf 0000 002b 0000 3287 00c8 fe83 0000 043b
4054160  0000 315f 2c78 0084 0002 438a 45b8 4714 35ec 47bc 4848 0018 3858 39a4 0016 45a8 001c 41e8 0000 3d67 3b4c 0000 0008 dd5c
4054240  001c 43c0 0200 0daf 4b8c 0000 0000 3287 6dd8 247c 0008 ba3c 0018 9328 9460 0018 386c 41e8 0000 2ae7 3b4c 0000 0008 dd9c
```

| | | | | | | | | | | | | | | | | | | | | | | | | |
|---|---|---|---|---|---|---|---|---|---|---|---|---|---|---|---|---|---|---|---|---|---|---|---|---|
| 4054320 | 0014 | 2c88 | 0012 | 41e8 | 0000 | 2ae7 | 3b4c | 0000 | 0008 | dd5c | 0014 | 3858 | 4254 | 0000 | 0000 | 8047 | 2420 | 0000 | 0008 | dd9c | 0018 | 4364 | 0000 | 0038 |
| 4054400 | b27c | b66c | 0000 | 11f2 | 0000 | 1217 | 0018 | 4368 | 0200 | 0db5 | 0500 | 1cdd | 0000 | 7647 | 0000 | 001b | 0000 | 3287 | 00b2 | 2d43 | 0000 | 043b | 0000 | 315f |
| 4054460 | 2c78 | 01a0 | 0002 | 438a | 45b8 | 4714 | 4768 | 9300 | 93a8 | 008e | 44a0 | 0000 | 0200 | 81c7 | 6dd8 | 6d94 | 3b4c | 0000 | 0008 | cf7c | 0028 | 4408 | 0100 | 0e4f |
| 4054540 | 4b8c | 0000 | 0000 | 81d7 | 4254 | 0000 | 000c | 81cf | 3b4c | 0000 | 0008 | dd9c | 0028 | 2e7c | ae74 | 0024 | 2ba0 | 0028 | 002c | 43e4 | 0100 | 81af | 5fa0 | 43c0 |
| 4054620 | 0200 | 0daf | 4b8c | 0000 | 0000 | 3287 | 6bb4 | 247c | 0008 | db5c | 0028 | aa88 | 0024 | 2e98 | 2c88 | 0004 | 2c58 | 43e4 | 0100 | 81af | 6d0c | 43c0 | 0200 | 0daf |
| 4054700 | 4b8c | 0000 | 0000 | 3287 | 6bb4 | 234c | 0008 | b2bc | 2e7c | ae74 | 0020 | 2ba0 | 0024 | 006a | 3b4c | 0000 | 0008 | d33c | 0024 | aa88 | 0020 | 2e98 | 2e7c | ae74 |
| 4054760 | 001c | 2ba0 | 0020 | 002e | 44a0 | 0000 | 0100 | 81af | 5fa0 | 43c0 | 0200 | 0daf | 4b8c | 0000 | 0000 | 3287 | 6bb4 | 247c | 0008 | db5c | 0020 | aa88 | 001c | 2e98 |
| 4055040 | 2c88 | 0004 | 2c58 | 43e4 | 0100 | 81af | 6d0c | 43c0 | 0200 | 0daf | 4b8c | 0000 | 0000 | 3287 | 6bb4 | 234c | 0008 | b2bc | 2c58 | 43e4 | 0200 | 81c7 | 6dd8 | 6d94 |
| 4055120 | 3b4c | 0000 | 0008 | cf7c | 0014 | 4409 | 0100 | 0e4f | 4b8c | 0000 | 0000 | 81d7 | 4254 | 0000 | 0000 | 81cf | 3b4c | 0000 | 0008 | dd9c | 0014 | 2e7c | ada8 | 2ba0 |
| 4055200 | 0014 | 002c | 44a0 | 0000 | 0100 | 81af | 5fa0 | 43c0 | 0200 | 0daf | 4b8c | 0000 | 0000 | 3287 | 6bb4 | 247c | 0008 | db5c | 0014 | aa34 | 2e98 | 2c88 | 0004 | 2c58 |
| 4055260 | 44a0 | 0000 | 0100 | 81af | 6d0c | 43c0 | 0200 | 0daf | 4b8c | 0000 | 0000 | 3287 | 6bb4 | 234c | 0008 | b2bc | 0018 | 442c | 0000 | 0038 | b27c | b66c | 0000 | 11f3 |
| 4055340 | 0000 | 1218 | 0018 | 4430 | 0200 | 0db5 | 0500 | 1cdd | 0000 | 805f | 0000 | 002b | 0000 | 3287 | 00c5 | 87c3 | 0000 | 043b | 0000 | 315f | 2c78 | 0090 | 0002 | 438a |
| 4055420 | 45b8 | 4700 | 4754 | 47f8 | 0024 | 4880 | 0018 | 0020 | 32f0 | 001c | 24d0 | 0000 | 0019 | 1e7c | 0028 | 43c0 | 0100 | 0e4f | 6d50 | 43e4 | 0300 | 7767 | 6b74 | 6e1c |
| 4055500 | 0024 | 6e1c | 0020 | 32d4 | 24d0 | 0000 | 0008 | cf7c | 0020 | 386c | 3818 | 39f8 | 0019 | 2004 | 0020 | 3880 | 4254 | 0000 | 0000 | 20f7 | 40b4 | 001c | 0008 | dd9c |
| 4055560 | 001c | 43e4 | 0400 | 767f | 6dd8 | 6d94 | 6d50 | 6d0c | 447c | 0000 | 0200 | 0daf | 4b8c | 0000 | 0000 | 3287 | 6bb4 | 234c | 0008 | b2bc | 0018 | 44a0 | 0000 | 0038 |
| 4055640 | b27c | b66c | 0000 | 11f4 | 0000 | 1219 | 0018 | 44a4 | 0200 | 0db5 | 0500 | 1cdd | 0000 | 81e7 | 0000 | 002b | 0000 | 3287 | 00c9 | 0123 | 0000 | 043b | 0000 | 315f |
| 4055720 | 2c78 | 003c | 0002 | 438a | 45e8 | 0020 | 4728 | 001c | 4754 | 47d0 | 4864 | 0018 | 3280 | 247c | 0019 | 1e7c | 0024 | 3984 | 001c | 0020 | 3984 | 0018 | 001c | 38e8 |
| 4056000 | 386c | 37f0 | 3cf4 | 234c | 0019 | 2044 | 0018 | 459c | 0000 | 0078 | b27c | b66c | 0000 | 11f5 | 0000 | 121a | 0018 | 45a0 | 0200 | 0db5 | 0500 | 1cdd | 0000 | 81ef |
| 4056060 | 0000 | 0033 | 0000 | 3287 | 00c9 | 0223 | 0000 | 043b | 0000 | 315f | 0018 | 459c | 0000 | 0040 | 0018 | aaa9 | 0000 | 0000 | 0000 | 0000 | 0018 | b8b8 | 0018 | b7d4 |
| 4056140 | 0018 | b6c0 | 0018 | b744 | 0000 | 0000 | 0000 | 0000 | 0018 | bb65 | 0018 | b634 | 0018 | a161 | 0018 | b531 | 0018 | b6f0 | 2c78 | 0084 | 0002 | 438a | 45e8 | 001c |
| 4056220 | 46ec | 4848 | 0018 | 4864 | 001c | 43c0 | 0100 | 0e4f | 6d50 | 43e4 | 0300 | 7767 | 6b74 | 6bc9 | 6c08 | 3aa0 | 0008 | cf7c | 0020 | 386c | 3818 | 39f8 | 0019 | 2004 |
| 4056300 | 0020 | 3880 | 4254 | 0000 | 0000 | 20f7 | 3af4 | 001c | 0008 | d19c | 001c | 3280 | 24d0 | 0000 | 0019 | 1f34 | 001c | 43e4 | 0400 | 767f | 6dd8 | 6d94 | 6d50 | 6d0c |
| 4056360 | 447c | 0000 | 0200 | 0daf | 4b8c | 0000 | 0000 | 3287 | 6bb4 | 234c | 0008 | b2bc | 0018 | 4618 | 0000 | 0038 | b27c | b66c | 0000 | 11f6 | 0000 | 121b | 0018 | 461c |
| 4056440 | 0200 | 0db5 | 0500 | 1cdd | 0000 | 81df | 0000 | 001b | 0000 | 3287 | 00c9 | 0023 | 0000 | 043b | 0000 | 315f | 27f0 | 0044 | 0018 | a674 | 3690 | 2520 | 46d8 | 35ec |
| 4056520 | 33d8 | 43c0 | 0100 | 30bf | 6c08 | 247c | 0019 | 2078 | 0018 | 343c | 329c | 247c | 0008 | cf7c | 0014 | 3d60 | 4254 | 0000 | 0000 | 1d17 | 3b4c | 0000 | 0008 | dd9c |
| 4056600 | 000c | 2eb0 | 0018 | 467c | 0000 | 0038 | b27c | b66c | 0000 | 11f7 | 0000 | 121c | 0018 | 4680 | 0200 | 0db5 | 0500 | 1cdd | 0000 | 776f | 0000 | 0013 | 0000 | 3287 |
| 4056660 | 00b2 | 54a3 | 0000 | 043b | 0000 | 315f | 27f0 | 002c | 0018 | bdf4 | 45b8 | 329c | 24d0 | 0000 | 0008 | cf7c | 0014 | 3d60 | 4254 | 0000 | 0000 | 1d17 | 3b4c | 0000 |
| 4056740 | 0008 | dd9c | 000c | 2eb0 | 0018 | 4738 | 0000 | 0070 | b27c | b66c | 0000 | 11f8 | 0000 | 121d | 0018 | 46b8 | 0200 | 0db5 | 0500 | 1cdd | 0000 | 81f7 | 0000 | 000b |
| 4057020 | 0000 | 3287 | 00c8 | f9a3 | 0000 | 043b | 0000 | 315f | 0018 | 4738 | 0000 | 0038 | b27c | b66c | 0000 | 11f9 | 0000 | 121e | 0018 | 473c | 0200 | 0db5 | 0500 | 1cdd |
| 4057100 | 0000 | 806f | 0000 | 0013 | 0000 | 3287 | 00c5 | 9123 | 0000 | 043b | 0000 | 315f | 2c78 | 004c | 0002 | 438a | 45e8 | 001c | 4714 | 3280 | 24d0 | 0000 | 0019 | 1e7c |
| 4057160 | 0020 | 38fc | 001c | 3228 | 320c | 329c | 24d0 | 0000 | 0019 | 1edc | 001c | 38e8 | 3228 | 320c | 32b8 | 247c | 0019 | 1edc | 0018 | 3d5c | 3d30 | 3cf4 | 242c | 0000 |
| 4057240 | 0019 | 20b0 | 0018 | 488c | 0000 | 00a8 | b27c | b66c | 0000 | 11fa | 0000 | 121f | 0018 | 4774 | 0200 | 0db5 | 0500 | 1cdd | 0000 | 8217 | 0000 | 0013 | 0000 | 3287 |
| 4057320 | 00c9 | 0683 | 0000 | 043b | 0000 | 315f | 0018 | 47a8 | 0000 | 0038 | b27c | b66c | 0000 | 11fb | 0000 | 1220 | 0018 | 47ac | 0200 | 0db5 | 0500 | 1cdd | 0000 | 820f |
| 4057400 | 0000 | 001b | 0000 | 3287 | 00c9 | 0583 | 0000 | 043b | 0000 | 315f | 0018 | 488c | 0000 | 0038 | b27c | b66c | 0000 | 11fc | 0000 | 1221 | 0018 | 4890 | 0200 | 0db5 |
| 4057460 | 0500 | 1cdd | 0000 | 2697 | 0000 | 001b | 0000 | 3287 | 00c9 | 09c3 | 0000 | 043b | 0000 | 315f | 2c78 | 00ac | 0002 | 438a | 45d0 | 46ec | 4740 | 3844 | 4254 | 0000 |
| 4057540 | 0000 | 821f | 3ba0 | 0000 | 0008 | dd9c | 0024 | 3364 | 3bf4 | 0000 | 0019 | 2158 | 0024 | 34a0 | 0020 | 3410 | 001c | 320c | 4300 | 0000 | 0000 | 53ff | 0019 | 2178 |
| 4057620 | 0024 | 3eec | 0020 | 41e8 | 0000 | 775f | 3c48 | 0000 | 0008 | dd9c | 0020 | 4408 | 0100 | 0e4f | 6e1c | 001c | 4254 | 0000 | 0000 | 386f | 3c48 | 0000 | 0008 | dd9c |
| 4057700 | 001c | 3d78 | 4254 | 0000 | 0000 | 20f7 | 3bf4 | 0000 | 0008 | dd9c | 0014 | 43e4 | 0200 | 80f7 | 6d50 | 6d0c | 447c | 0000 | 0200 | 0daf | 4b8c | 0000 | 0000 | 3287 |
| 4057760 | 6bb4 | 234c | 0008 | b2bc | 0018 | 4988 | 0000 | 00b8 | b27c | b66c | 0000 | 11fd | 0000 | 1222 | 0018 | 498c | 0200 | 0db5 | 0500 | 1cdd | 0000 | 8227 | 0000 | 0013 |
| 4060040 | 0000 | 3287 | 00c9 | 0ac3 | 0000 | 043b | 0000 | 315f | 0018 | 4988 | 0000 | 0080 | 0000 | 0000 | 0000 | 0000 | 0018 | b0d8 | 0000 | 0000 | 0000 | 0000 | 0000 | 0000 |
| 4060120 | 0018 | 9fdc | 0018 | a0c4 | 0018 | a388 | 0019 | 23c4 | 0019 | 22e4 | 0019 | 2314 | 0000 | 0000 | 0000 | 0000 | 0000 | 0000 | 0000 | 0000 | 0018 | b1a0 | 0000 | 0000 |
| 4060200 | 0000 | 0000 | 0019 | 2444 | 0019 | 24a0 | 0019 | 2414 | 0019 | 252c | 0000 | 0000 | 0018 | a058 | 0000 | 0000 | 0000 | 0000 | 0018 | b06c | 0000 | 0000 | 0019 | 2584 |
| 4060260 | 2c78 | 0044 | 0002 | 438a | 2520 | 46ec | 33d8 | 41e8 | 0000 | 822f | 2410 | 0000 | 0008 | c35c | 0018 | 33a0 | 4254 | 0000 | 0000 | 8237 | 40f4 | 0000 | 0008 | c35c |
| 4060340 | 0014 | 3858 | 4254 | 0000 | 0000 | 2697 | 3cf4 | 234c | 0008 | c35c | 0018 | 4ad0 | 0000 | 0038 | b27c | b66c | 0000 | 11fe | 0000 | 1223 | 0018 | 4ad4 | 0200 | 0db5 |
| 4060420 | 0500 | 1cdd | 0000 | 80ef | 0000 | 0003 | 0000 | 3287 | 00c5 | c0a3 | 0000 | 043b | 0000 | 315f | 2c78 | 0110 | 0002 | 438a | 2520 | 4408 | 0200 | 3d5f | 4b8c | 0000 |
| 4060500 | 0000 | 12c3 | 4b8c | 0000 | 0000 | 12c3 | 4254 | 0000 | 0000 | 80c7 | 447c | 0000 | 0100 | 0e4f | 4b8c | 0000 | 0000 | 803f | 24d0 | 0000 | 0016 | 45a8 | 000c | 41e8 |
| 4060560 | 0000 | 3d67 | 447c | 0000 | 0100 | 0e4f | 4b8c | 0000 | 0000 | 803f | 24d0 | 0000 | 0008 | dd5c | 000c | 41e8 | 0000 | 2ae7 | 447c | 0000 | 0100 | 0e4f | 4b8c | 0000 |
| 4060640 | 0000 | 803f | 24d0 | 0000 | 0008 | dd5c | 000c | 41e8 | 0000 | 823f | 447c | 0000 | 0100 | 0e4f | 4b8c | 0000 | 0000 | 803f | 24d0 | 0000 | 0008 | dd5c | 000c | 41fc |
| 4060720 | 0000 | 2aa7 | 4254 | 0000 | 0000 | 7657 | 447c | 0000 | 0100 | 0e4f | 4b8c | 0000 | 0000 | 803f | 24d0 | 0000 | 0008 | dd9c | 000c | 43c0 | 0100 | 0e4f | 4b8c | 0000 |
| 4061000 | 0000 | 803f | 44c4 | 0000 | 0300 | 7667 | 6b74 | 4af8 | 0000 | 8247 | 4b9c | 0000 | 0000 | 0003 | 4254 | 0000 | 0000 | 765f | 447c | 0000 | 0100 | 0e4f | 4b8c | 0000 |
| 4061060 | 0000 | 803f | 242c | 0000 | 0008 | dd9c | 0018 | 4be0 | 0000 | 00e0 | b27c | b66c | 0000 | 11ff | 0000 | 1224 | 0018 | 4b0c | 0200 | 0db5 | 0500 | 1cdd | 0000 | 8247 |
| 4061140 | 0000 | 0013 | 0000 | 3287 | 00c9 | 0d63 | 0000 | 043b | 0000 | 315f | 0018 | 4b40 | 0000 | 0038 | b27c | b66c | 0000 | 1200 | 0000 | 1225 | 0018 | 4b44 | 0200 | 0db5 |
| 4061220 | 0500 | 1cdd | 0000 | 80d7 | 0000 | 0003 | 0000 | 3287 | 00c5 | bba3 | 0000 | 043b | 0000 | 315f | 0018 | 4b78 | 0000 | 0038 | b27c | b66c | 0000 | 1201 | 0000 | 1226 |
| 4061300 | 0018 | 4b7c | 0200 | 0db5 | 0500 | 1cdd | 0000 | 824f | 0000 | 0003 | 0000 | 3287 | 00c9 | 1063 | 0000 | 043b | 0000 | 315f | 0018 | 4be0 | 0000 | 0038 | b27c | b66c |
| 4061360 | 0000 | 1202 | 0000 | 1227 | 0018 | 4be4 | 0200 | 0db5 | 0500 | 1cdd | 0000 | 8257 | 0000 | 000b | 0000 | 3287 | 00c9 | 1403 | 0000 | 043b | 0000 | 315f | 2954 | 0030 |

| | | | | | | | | | | | | | | | | | | | | | | | | |
|---|---|---|---|---|---|---|---|---|---|---|---|---|---|---|---|---|---|---|---|---|---|---|---|---|
| 4061440 | 0002 | 438a | 45b8 | 43e4 | 0200 | 81cf | 4b8c | 0000 | 0000 | 2137 | 4b8c | 0000 | 0000 | 0103 | 3b4c | 0000 | 0008 | cf7c | 0010 | 2340 | 0019 | 22d4 | 0018 | 4c78 |
| 4061520 | 0000 | c038 | b27c | b66c | 0000 | 1203 | 0000 | 1228 | 0018 | 4c7c | 0200 | 0db5 | 0500 | 1cdd | 0000 | 8267 | 0000 | 000b | 0000 | 3287 | 00c9 | 16a3 | 0000 | 043b |
| 4061600 | 0000 | 315f | 27f0 | 0060 | 0018 | bdc4 | 45b8 | 3500 | 0018 | 3484 | 3410 | 001c | 3380 | 0020 | 329c | 247c | 0019 | 2304 | 0024 | 43e4 | 0400 | 386f | 6e1c | 0020 |
| 4061660 | 6e1c | 001c | 6dd8 | 6d94 | 447c | 0000 | 0100 | 0e4f | 6d50 | 247c | 000b | 43b0 | 0014 | 4408 | 0100 | 0e4f | 6d50 | 41e8 | 0000 | 1d17 | 3b4c | 0000 | 0008 | dd9c |
| 4061740 | 000c | c5a8 | 0018 | 4e1c | 0000 | 0038 | b27c | b66c | 0000 | 1204 | 0000 | 1229 | 0018 | 4e20 | 0200 | 0db5 | 0500 | 1cdd | 0000 | 386f | 0000 | 002b | 0000 | 3287 |
| 4062020 | 00c9 | 1823 | 0000 | 043b | 0000 | 315f | 27f0 | 0032 | 0018 | 4ce0 | 4e1c | 0000 | 0003 | 76b7 | 4e70 | 0000 | 0030 | 76b7 | 4ec4 | 0000 | 0000 | 06e3 | 4f18 | 0000 |
| 4062100 | 0000 | 0003 | 4dc0 | 0018 | 0000 | 0003 | 228c | 0a09 | 28c4 | 0032 | 0018 | 4d14 | 4e1c | 0000 | 0000 | 826f | 4e70 | 0000 | 0000 | 826f | 4ec4 | 0000 | 0000 | 0003 |
| 4062160 | 4f18 | 0000 | 0000 | 0643 | 4dc0 | 0018 | 0000 | 0003 | 228c | 646c | 28c4 | 0032 | 0018 | 4d48 | 4e1c | 0000 | 0000 | 8277 | 4e70 | 0000 | 0000 | 8277 | 4ec4 | 0000 |
| 4062240 | 0000 | 0003 | 4f18 | 0000 | 0000 | 0003 | 4dc0 | 0018 | 0000 | 07fb | 228c | 652c | 28c4 | 0032 | 0018 | 4d7c | 4e1c | 0000 | 0000 | 827f | 4e70 | 0000 | 0000 | 827f |
| 4062320 | 4ec4 | 0000 | 0000 | 0643 | 4f18 | 0000 | 0000 | 0003 | 4dc0 | 0018 | 0000 | 0643 | 228c | 746f | 28c4 | 0032 | 0018 | 4db0 | 4e1c | 0000 | 0000 | 76cf | 4e70 | 0000 |
| 4062400 | 0000 | 76cf | 4ec4 | 0000 | 0000 | 06e3 | 4f18 | 0000 | 0000 | 0693 | 4dc0 | 0018 | 0000 | 0003 | 228c | 726d | 28c4 | 0032 | 0018 | 4de4 | 4e1c | 0000 | 0000 | 8287 |
| 4062460 | 4e70 | 0000 | 0000 | 828f | 4ec4 | 0000 | 0000 | 07fb | 4f18 | 0000 | 0000 | 07fb | 4dc0 | 0018 | 0000 | 0003 | 229c | 776c | 2954 | 0032 | 0002 | 438a | 4e1c | 0000 |
| 4062540 | 0000 | 8297 | 4e70 | 0000 | 0000 | 829f | 4ec4 | 0000 | 0000 | 00a3 | 4f18 | 0000 | 0000 | 00a3 | 4dc0 | 0018 | 0000 | 00a3 | 228c | 2525 | 0018 | 4f08 | 0000 | 0038 |
| 4062620 | b27c | b66c | 0000 | 1205 | 0000 | 122a | 0018 | 4f0c | 0200 | 0db5 | 0500 | 1cdd | 0000 | 825f | 0000 | 0003 | 0000 | 3287 | 00c9 | 1503 | 0000 | 043b | 0000 | 315f |
| 4062700 | 2c78 | 00b4 | 0002 | 438a | 2520 | 43e4 | 0200 | 387f | 4b8c | 0000 | 0000 | 773f | 4b8c | 0000 | 0000 | 0003 | 3280 | 247c | 0008 | cf7c | 0018 | 3244 | 3228 | 3348 |
| 4062760 | 4300 | 0000 | 0000 | 51ff | 0019 | 2178 | 0018 | 3d3c | 329c | 247c | 0008 | cf7c | 0014 | 41fc | 0000 | 228f | 4254 | 0000 | 0000 | 82a7 | 3ba0 | 0000 | 0008 | dd9c |
| 4063040 | 0014 | 3858 | 37dc | 43c0 | 0100 | 0e4f | 4b8c | 0000 | 0000 | 8067 | 24d0 | 0000 | 0019 | 23f4 | 0014 | 3d60 | 37dc | 43c0 | 0100 | 0e4f | 4b8c | 0000 | 0000 | 7757 |
| 4063120 | 24d0 | 0000 | 0019 | 2414 | 0010 | 3d24 | 447c | 0000 | 0100 | 0e4f | 4b8c | 0000 | 0000 | 30bf | 242c | 0000 | 0019 | 2434 | 0018 | 4ff4 | 0000 | 0038 | b27c | b66c |
| 4063200 | 0000 | 1206 | 0000 | 122b | 0018 | 4ff8 | 0200 | 0db5 | 0500 | 1cdd | 0000 | 32af | 0000 | 001b | 0000 | 3287 | 00c9 | 1fa3 | 0000 | 043b | 0000 | 315f | 2954 | 00b4 |
| 4063260 | 0002 | 438a | 45b8 | 3574 | 4790 | 0024 | 44a0 | 0000 | 0200 | 387f | 4b8c | 0000 | 0000 | 8067 | 6b48 | 39a4 | 0008 | cf7c | 0028 | 3410 | 0020 | 382c | 0024 | 42ac |
| 4063340 | 0000 | 82cf | 0019 | 2490 | 0024 | 3eec | 0020 | 41e8 | 0000 | 1d17 | 3b4c | 0000 | 0008 | df5c | 0020 | 3468 | 33f4 | 3380 | 001c | 42ac | 0000 | 8067 | 0019 | 2178 |
| 4063420 | 0020 | 3e70 | 001c | 329c | 24d0 | 0000 | 0008 | cf7c | 001c | 4408 | 0100 | 0e4f | 6dd8 | 41e8 | 0000 | 386f | 3ba0 | 0000 | 0008 | dd9c | 0018 | 316c | 4254 | 0000 |
| 4063500 | 0000 | 775f | 3ba0 | 0000 | 0008 | dd9c | 0014 | 3d60 | 4254 | 0000 | 0000 | 1d17 | 2420 | 0000 | 0008 | dd9c | 0018 | 50e0 | 0000 | 0038 | b27c | b66c | 0000 | 1207 |
| 4063560 | 0000 | 122c | 0018 | 50e4 | 0200 | 0db5 | 0500 | 1cdd | 0000 | 82b7 | 0000 | 001b | 0000 | 3287 | 00c9 | 20a3 | 0000 | 043b | 0000 | 315f | 2954 | 00b4 | 0002 | 438a |
| 4063640 | 45b8 | 3574 | 4790 | 0024 | 44a0 | 0000 | 0200 | 387f | 4b8c | 0000 | 0000 | 7757 | 6b48 | 39a4 | 0008 | cf7c | 0028 | 3410 | 0020 | 382c | 0024 | 42ac | 0000 | 7757 |
| 4063720 | 0019 | 2490 | 0024 | 3eec | 0020 | 41e8 | 0000 | 1d17 | 3b4c | 0000 | 0008 | df5c | 0020 | 3468 | 33f4 | 3380 | 001c | 42ac | 0000 | 7757 | 0019 | 2178 | 0020 | 3e70 |
| 4064000 | 001c | 329c | 24d0 | 0000 | 0008 | cf7c | 001c | 4408 | 0100 | 0e4f | 6dd8 | 41e8 | 0000 | 386f | 3ba0 | 0000 | 0008 | dd9c | 0018 | 3d6c | 4254 | 0000 | 0000 | 775f |
| 4064060 | 3ba0 | 0000 | 0008 | dd9c | 0014 | 3d60 | 4254 | 0000 | 0000 | 1d17 | 2420 | 0000 | 0008 | dd9c | 0018 | 5378 | 0000 | 0070 | b27c | b66c | 0000 | 1209 | 0000 | 122d |
| 4064140 | 0018 | 511c | 0200 | 0db5 | 0500 | 1cdd | 0000 | 82bf | 0000 | 0013 | 0000 | 3287 | 00c9 | 21a3 | 0000 | 043b | 0000 | 315f | 0018 | 5378 | 0000 | 0038 | b27c | b66c |
| 4064220 | 0000 | 1209 | 0000 | 122e | 0018 | 537c | 0200 | 0db5 | 0500 | 1cdd | 0000 | 82c7 | 0000 | 001b | 0000 | 3287 | 00c9 | 2483 | 0000 | 043b | 0000 | 315f | 27f0 | 0112 |
| 4064300 | 0018 | 5260 | 4e1c | 0000 | 0000 | 82cf | 57b8 | 62c0 | 5de8 | 0000 | 0500 | 82d7 | 4b8c | 0000 | 0000 | 2697 | 4b8c | 0000 | 0000 | 82df | 6784 | 6b88 | 4b8c | 0000 |
| 4064360 | 0000 | 2697 | 5de8 | 0000 | 0200 | 82e7 | 4b8c | 0000 | 0000 | 0193 | 4b8c | 0000 | 0000 | 0003 | 56f8 | 62c0 | 5de8 | 0000 | 0500 | 82d7 | 4b8c | 0000 | 0000 | 2697 |
| 4064440 | 4b8c | 0000 | 0000 | 82ef | 6784 | 6b88 | 4b8c | 0000 | 0000 | 2697 | 5de8 | 0000 | 0200 | 82e7 | 4b8c | 0000 | 0000 | 0193 | 4b8c | 0000 | 0000 | 0323 | 56f8 | 62c0 |
| 4064520 | 5de8 | 0000 | 0500 | 82d7 | 4b8c | 0000 | 0000 | 2697 | 4b8c | 0000 | 0000 | 5a9f | 6784 | 6b88 | 4b8c | 0000 | 0000 | 2697 | 5de8 | 0000 | 0200 | 82e7 | 4b8c | 0000 |
| 4064600 | 0000 | 0323 | 4b8c | 0000 | 0000 | 0193 | 56f8 | 671c | 5370 | 5aec | 0500 | 82d7 | 4b8c | 0000 | 0000 | 2697 | 4b8c | 0000 | 0000 | 82f7 | 671c | 6b88 | 4b8c | 0000 |
| 4064660 | 0000 | 2697 | 5d10 | 0000 | 0200 | 82e7 | 4b8c | 0000 | 0000 | 0003 | 4b8c | 0000 | 0000 | 0193 | 228c | 203a | 2954 | 0112 | 0002 | 438a | 4e1c | 0000 | 0000 | 7757 |
| 4064740 | 57b8 | 62c0 | 5de8 | 0000 | 0500 | 82d7 | 4b8c | 0000 | 0000 | 2697 | 4b8c | 0000 | 0000 | 82ff | 6784 | 6b88 | 4b8c | 0000 | 0000 | 2697 | 5de8 | 0000 | 0200 | 82e7 |
| 4065020 | 4b8c | 0000 | 0000 | 0193 | 4b8c | 0000 | 0000 | 0003 | 56f8 | 62c0 | 5de8 | 0000 | 0500 | 82d7 | 4b8c | 0000 | 0000 | 2697 | 4b8c | 0000 | 0000 | 8307 | 6784 | 6b88 |
| 4065100 | 4b8c | 0000 | 0000 | 2697 | 5de8 | 0000 | 0200 | 82e7 | 4b8c | 0000 | 0000 | 0193 | 4b8c | 0000 | 0000 | 0323 | 56f8 | 62c0 | 5de8 | 0000 | 0500 | 82d7 | 4b8c | 0000 |
| 4065160 | 0000 | 2697 | 4b8c | 0000 | 0000 | 830f | 6784 | 6b88 | 4b8c | 0000 | 0000 | 2697 | 5de8 | 0000 | 0200 | 82e7 | 4b8c | 0000 | 0000 | 0003 | 4b8c | 0000 | 0000 | 0193 |
| 4065240 | 56f8 | 671c | 5370 | 5aec | 0500 | 82d7 | 4b8c | 0000 | 0000 | 2697 | 4b8c | 0000 | 0000 | 2da7 | 671c | 6b88 | 4b8c | 0000 | 0000 | 2697 | 5d10 | 0000 | 0200 | 82e7 |
| 4065320 | 4b8c | 0000 | 0000 | 0323 | 4b8c | 0000 | 0000 | 0193 | 228c | 2067 | 0018 | 548c | 0000 | 0038 | b27c | b66c | 0000 | 120a | 0000 | 122f | 0018 | 5490 | 0200 | 0db5 |
| 4065400 | 0500 | 1cdd | 0000 | 81ff | 0000 | 0023 | 0000 | 3287 | 00c9 | 0bc3 | 0000 | 043b | 0000 | 315f | 27f0 | 004a | 0018 | 53f8 | 4e1c | 0000 | 0000 | 7757 | 5d7c | 0000 |
| 4065460 | 0400 | 7757 | 4b8c | 0000 | ffff | ff63 | 4b8c | 0000 | ffff | ff63 | 4b8c | 0000 | 0000 | 0143 | 4b8c | 0000 | 0000 | 0143 | 4ec4 | 0000 | 0000 | 8277 | 4f18 | 0000 |
| 4065540 | 0000 | c02b | 228c | 6652 | 28c4 | 0042 | 0018 | 543c | 4e1c | 0000 | 0000 | 8067 | 5d7c | 0000 | 0300 | 8067 | 4b8c | 0000 | 0000 | 0003 | 4b8c | 0000 | 0000 | 0003 |
| 4065620 | 4b8c | 0000 | 0000 | 00a3 | 4ec4 | 0000 | 0000 | 76b7 | 4f18 | 0000 | 0000 | 002b | 228c | 5d2c | 2954 | 004a | 0002 | 438a | 4e1c | 0000 | 0000 | 53ff | 5d7c | 0000 |
| 4065700 | 0400 | 53ff | 4b8c | 0000 | 0000 | 0003 | 4b8c | 0000 | 0000 | 0003 | 4b8c | 0000 | 0000 | 0003 | 4b8c | 0000 | 0000 | 0003 | 4ec4 | 0000 | 0000 | 826f | 4f18 | 0000 |
| 4065760 | 0000 | 001b | 228c | 6e28 | 0018 | 5778 | 0000 | 0038 | b130 | b66c | 0000 | 120b | 0000 | 1230 | 0018 | 3f21 | 0200 | 0db5 | 0500 | 1cdd | 0000 | 81ff | 0000 | 001b |
| 4066040 | 0000 | 3287 | 00c9 | 03c3 | 0000 | 043b | 0000 | 315f | 27f0 | 003a | 0018 | 54fc | 5d10 | 0000 | 0100 | 30bf | 4b8c | 0000 | 0000 | 7757 | 5de8 | 0000 | 0400 | 30bf |
| 4066120 | 6b88 | 4af8 | 0000 | 0003 | 4b8c | 0000 | 0000 | 0003 | 4b8c | 0000 | 0000 | 7777 | 228c | 4772 | 28c4 | 003a | 0018 | 5538 | 5d10 | 0000 | 0100 | 30bf | 4b8c | 0000 |
| 4066200 | 0000 | 8067 | 5de8 | 0000 | 0400 | 30bf | 6b88 | 4af8 | 0000 | 0003 | 4b8c | 0000 | 0000 | 0003 | 4b8c | 0000 | 0000 | 7777 | 228c | 6170 | 2954 | 003a | 0002 | 438a |
| 4066260 | 5d10 | 0000 | 0100 | 30bf | 4b8c | 0000 | 0000 | 30bf | 5de8 | 0000 | 0400 | 30bf | 6b88 | 4af8 | 0000 | 0003 | 4b8c | 0000 | 0000 | 0003 | 4b8c | 0000 | 0000 | 7777 |
| 4066340 | 228c | 6170 | 0000 | 0000 | 0000 | 0000 | 0000 | 0000 | 0016 | 6ca5 | 0000 | 0000 | 000c | c951 | 0000 | 0000 | 0016 | 427d | 0000 | 0000 | 0011 | 416c | 0000 | 0000 |
| 4066420 | 0000 | 0000 | 0000 | 0000 | 0000 | 0000 | 0000 | 0000 | 0000 | 0000 | 0000 | 0000 | 0000 | 0000 | 000f | c45c | 0000 | 0000 | 0000 | 0000 | 0000 | 0000 | 0000 | 0000 |
| 4066500 | 000f | c46c | 0000 | 0000 | 0014 | 7f48 | 0000 | 0000 | 000b | 1e2c | 0000 | 0000 | 0017 | f2fd | 0000 | 0000 | 0017 | f08c | 000f | 86b4 | 0000 | 0000 | 0000 | 0000 |

```
4066560  0000 0000 0017 f31d 0000 0000 0011 25f8 0000 0000 0015 b8e4 0000 0000 0012 7ce5 0000 0000 0000 0000 0000 0000 0000 0000
4066640  0018 b8b8 0015 b734 0019 9b39 0000 0000 0014 8550 0018 b908 0000 0000 0019 93b1 0000 0000 0000 0000 0000 0000 0000 0000
4066720  000e 838c 0000 0000 000b 3f94 0016 2335 000f d0c8 0010 a870 0000 0000 0017 a7a9 0000 0000 0000 0000 0000 0000 0012 c2e4
4067000  000c 1258 0000 0000 0000 0000 000b 4390 0014 541d 000d c980 0000 0000 0017 f0bc 000c f008 0019 d424 0000 0000 0000 0000
4067060  0000 0000 0000 0000 0000 0000 0011 695c 0019 d338 0000 0000 000f d191 0011 4b5c 0012 c590 0011 3830 000a 3021 0010 d844
4067140  001a 3fc8 0018 39bd 0000 0000 000b b368 0000 0000 0000 0000 0011 6884 0000 0000 0011 6594 0000 0000 0011 6584 0000 0000
4067220  0000 0000 000c eb2c 0018 3b14 0000 0000 0000 0000 000d 77f0 0000 0000 0018 aac9 0000 0000 000d d290 0016 47ec 0000 0000
4067300  0000 0000 0000 0000 0000 0000 0000 0000 0000 0000 0000 0000 0000 0000 0000 0000 000a d114 0018 5c70 0000 04f0 6f64 6531
4067360  2c4e 6f64 6532 2920 3a2d 0a09 2869 735f 7661 7269 6162 6c65 284e 6f64 6531 292c 2021 3b20 6973 5f63 6f6e 7374 616e 7428
4067440  4e6f 6465 3129 2c20 213b 2069 735f 695f 6e6f 6465 284e 6f64 6531 292c 2021 3b0a 0920 6973 5f69 6e74 6572 6d65 6469 6174
4067520  6528 4e6f 6465 3129 2c20 213b 2069 735f 636f 6e74 726f 6c28 4e6f 6465 3129 292c 0a09 6973 5f6f 7065 7261 746f 7228 4e6f
4067600  6465 3229 2c0a 0969 735f 696e 7075 745f 6f66 284e 6f64 6532 2c20 4e6f 6465 3129 2e0a 6973 5f63 6f6e 6e65 6374 6564 284e
4067660  6f64 6531 2c4e 6f64 6532 2920 3a2d 0a09 6973 5f6f 7065 7261 746f 7228 4e6f 6465 3129 2c0a 0928 0a09 2020 2020 6973 5f6f
4067740  7065 7261 746f 7228 4e6f 6465 3229 202d 3e0a 0920 2020 2069 735f 696e 7075 745f 6f66 284e 6f64 6532 2c20 5661 7229 2c0a
4070020  0920 2020 2069 735f 6f75 7470 7574 5f6f 6628 4e6f 6465 312c 2056 6172 290a 093b 0a09 2020 2020 2869 735f 7661 7269 6162
4070100  6c65 284e 6f64 6532 292c 213b 2069 735f 636f 6e73 7461 6e74 284e 6f64 6532 292c 213b 2069 735f 696f 6e6f 6465 284e 6f64
4070160  6532 292c 2021 3b0a 0920 2020 2020 6973 5f69 6e74 6572 6d65 6469 6174 6528 4e6f 6465 3229 2c20 213b 2069 735f 636f 6e74
4070240  726f 6c28 4e6f 6465 3229 292c 0a09 2020 2020 6973 5f6f 7574 7075 745f 6964 5f6f 6628 4e6f 6465 312c 204e 6f64 6532 290a
4070320  0929 2e0a 0a69 735f 696e 7075 745f 6f66 284f 7049 642c 2056 6172 2920 3a2d 0a09 6f70 6572 6174 6f72 5f69 6428 4f70 2c20
4070400  4f70 4964 292c 0a09 696e 7075 745f 6f66 284f 702c 2056 6172 292e 0a0a 6973 5f6f 7574 7075 745f 6f66 284f 7049 642c 2056
4070460  6172 2920 3a2d 0a09 6f70 6572 6174 6f72 5f69 6428 4f70 2c20 4f70 4964 292c 0a09 6f75 7470 7574 5f6f 6628 4f70 2c20 5661
4070540  7229 2e0a 0a69 735f 6f75 7470 7574 5f69 645f 6f66 284f 7049 642c 2056 6172 4964 2920 3a2d 0a09 6f70 6572 6174 6f72 5f69
4070620  6428 4f70 2c20 4f70 4964 292c 0a09 6f75 7470 7574 5f6f 6628 4f70 2c20 4964 292c 0a09 696f 6e6f 6465 5f69 6428 494f 6e6f
4070700  6465 2c20 4964 292c 0a09 6578 6973 7473 2849 4f6e 6f64 6529 2c0a 0969 6f6e 6f64 655f 7661 7269 6162 6c65 5f69 6428 494f
4070760  6e6f 6465 2c20 5661 7249 6429 2e0a 0a25 2525 2525 2525 2525 2525 2525 2525 2525 2525 2525 2525 2525 2525 2525 2525 2525
4071040  2525 2525 2525 2525 2525 2525 2525 2525 2525 2525 2525 2525 2525 2525 2525 2525 2525 2525 2525 2525 2525 2525 250a 2525
4071120  2525 2042 7569 6c64 2067 7261 7068 2066 6f72 2061 2070 726f 6362 6f64 792e 0a0a 2525 2525 2047 6574 2074 6865 2072 6561
4071200  6c20 696e 7075 7473 2061 6e64 206f 7574 7075 7473 206f 6620 6120 7072 6f63 6573 7320 626f 6479 2e0a 0a70 726f 6362 6f64
4071260  795f 7265 616c 5f69 6f73 2850 726f 6342 6f64 7949 642c 2052 6561 6c49 6e70 7574 732c 2052 6561 6c4f 7574 7075 7473 2920
4071340  3a2d 0a09 6973 5f70 726f 6362 6f64 7928 5072 6f63 426f 6479 4964 292c 0a09 7072 6f63 626f 6479 5f69 6428 5072 6f63 426f
4071420  6479 2c20 5072 6f63 426f 6479 4964 292c 0a09 6578 6973 7473 5f70 726f 6362 6f64 7928 5072 6f63 426f 6479 292c 0a09 7072
4071500  6f63 626f 6479 5f6f 7065 7261 746f 7273 2850 726f 6342 6f64 792c 204f 7065 7261 746f 7249 6473 292c 0a09 6f70 6572 6174
4071560  6f72 5f62 6c6f 636b 5f72 6561 6c5f 696f 7328 4f70 6572 6174 6f72 4964 732c 2052 6561 6c49 6e70 7574 732c 2052 6561 6c4f
4071640  7574 7075 7473 292e 0a0a 2525 2525 2042 7569 6c64 2061 2064 6174 6120 666c 6f77 2067 7261 7068 2066 6f72 2061 2070 726f
4071720  6362 6f64 0018 7c84 000b ab9c 0018 5da4 0000 00bc b298 b66c 0000 118a 7fff ffff 0018 ae10 0200 0db5 0100 15ad 0100 33fd
4072000  0000 000b 0000 315f 0018 5cc8 0000 002c b288 b66c 0000 118a 7fff ffff 0018 5c74 0200 0db5 0100 15ad 0100 33fd 0000 000b
4072060  0000 315f 0018 5d00 0000 0038 b27c b66c 0000 118b 0000 11b7 0018 5da8 0200 0db5 0500 1cdd 0000 7fff 0000 0023 0000 3287
4072140  00c5 6f83 0000 0423 0000 315f 0018 5da4 0000 002c b4f0 b4e4 0000 118a 7fff ffff 0008 b0dd 0000 0000 0000 0000 0018 7a20
4072220  0002 438a 0018 be60 2c78 0078 0002 438a 2520 4728 0020 4790 0024 47bc 3410 001c 4254 0000 0000 246f 24d0 0000 0018 ae1c
4072300  0028 33f4 4254 0000 0000 555f 33f4 0024 0018 ae1c 0024 33d8 332c 0020 4538 6e1c 001c 5370 24d0 0000 000c 4118 001c 33a0
4072360  4550 6dd8 5370 408c 000c 4118 0014 41fc 0000 8017 37f0 3cf4 242c 0000 0018 ae3c 0018 5fa8 0000 00a8 b27c b66c 0000 118c
4072440  0000 11b8 0018 53e0 0200 0db5 0500 1cdd 0000 8007 0000 001b 0000 3287 00c5 70e3 0000 0423 0000 315f 0018 5e14 0000 0038
4072520  b27c b66c 0000 118d 0000 11b9 0018 5e18 0200 0db5 0500 1cdd 0000 800f 0000 001b 0000 3287 00c5 71e3 0000 0423 0000 315f
4072600  0018 5fa8 0000 0038 b27c b66c 0000 118e 0000 11ba 0018 5fac 0200 0db5 0500 1cdd 0000 801f 0000 0013 0000 3287 00c5 76e3
4072660  0000 0423 0000 315f 2c78 015c 0002 438a 45b8 4714 32f0 0040 4e1c 0000 0000 232b 32f0 003c 4e1c 0000 0000 1b5b 32f0 0038
4072740  4e1c 0000 0000 0283 32f0 0030 4e1c 0000 0000 0193 3380 002c 3b4c 0000 0008 c83c 0044 332c 3b4c 0000 0018 af38 0044 aa88
4073020  0040 aa88 002c 9eb8 ac90 aa88 003c aa34 9eb8 ac08 4550 6b74 5370 4538 6bf4 6bb4 4550 6e1c 0038 6b74 32f0 0034 24d0 0000
4073100  0014 0a98 0038 4538 6e1c 0034 5370 4550 6e1c 0030 6b74 32b8 24d0 0000 0018 ab40 0030 aa50 aa34 9de0 ae74 0020 aa50 aa88
4073160  002c 9de0 ae74 001c 44a0 0000 0200 3d5f 6e58 0020 6e58 001c 447c 0000 0200 3d5f 6af0 0028 6af0 0024 24d0 0000 0018 af58
4073240  002c 43c0 0200 3d5f 6e58 0028 6e58 0024 44c4 0000 0200 0daf 4b8c 0000 0000 3d5f 6b74 43c0 0200 3d5f 6e58 0020 6e58 001c
4073320  44a0 0000 0200 0daf 4b6c 0000 0000 8047 6b74 4538 6bb4 5370 4550 6bf4 6b74 43c0 0100 0e4f 4b8c 0000 0000 803f 24d0 0000
4073400  0008 df1c 001c 38e8 3d6c 3d30 2420 0000 0018 af78 0018 6048 0000 0038 b27c b66c 0000 118f 0000 11bb 0018 604c 0200 0db5
4073460  0500 1cdd 0000 8037 0000 0013 0000 3287 00c5 7ac3 0000 0423 0000 315f 27f0 0034 0018 6010 5d10 0000 0200 3d5f 64a8 5b58
4073540  0200 3d5f 6160 92d0 9410 92bc 9410 a8ac aaf0 fff2 aed4 a890 aaf0 fff2 aec0 7220 2954 0034 0002 438a 5d10 0000 0200 3d5f
4073620  62c0 5b58 0200 3d5f 6464 92d0 9410 92a8 9410 a8ac aaf0 000e aee8 a874 aaf0 000e aec0 7220 0018 6124 0000 0070 b27c b66c
```

```
4073700  0000 1190 0000 11bc 0018 6084 0200 0db5 0500 1cdd 0000 804f 0000 0023 0000 3287 00c5 7bc3 0000 0423 0000 315f 0018 6124
4073760  0000 0038 b27c b66c 0000 1191 0000 11bd 0018 6128 0200 0db5 0500 1cdd 0000 804f 0000 002b 0000 3287 00c5 8023 0000 0423
4074040  0000 315f 2954 006c 0002 438a 56f8 687c 0020 69b0 46ec 4760 47f8 001c 4864 0018 3380 0024 3af4 0020 0008 c83c 0028 aa34
4074120  aa88 0024 9db0 aaf0 0001 aa50 9de0 aab4 0002 9eb8 ac90 3968 0018 38fc 001c 3804 3af4 0020 0018 b05c 0020 aa88 001c aa50
4074200  9d88 acd4 2ecc 3968 0018 231c 0018 b004 0018 61a0 0000 0038 b27c b66c 0000 1192 0000 11be 0018 61a4 0200 0db5 0500 1cdd
4074260  0000 6057 0000 002b 0000 3287 00c5 82e3 0000 0423 0000 315f 2954 0044 0002 438a 56f8 671c 682c 46ec 4790 001c 47d0 4864
4074340  0018 38d4 3894 001c 35c8 3aa0 000b 1524 0020 aa88 001c aa34 9d88 ac90 2ecc 3968 0018 38d4 2410 0000 0018 b05c 0018 66c8
4074420  0000 0038 b27c b66c 0000 1193 0000 11bf 0018 66cc 0200 0db5 0500 1cdd 0000 8017 0000 001b 0000 3287 00c5 8643 0000 0423
4074500  0000 315f 27f0 0054 0018 b108 45b8 4700 477c 39a4 0012 07f8 0020 37dc 32f0 001c 24d0 0000 0012 0e80 0020 3c9c 0000 001c
4074560  0012 73cc 0020 332c 40b4 001c 0012 0838 001c 3968 0018 38d4 4268 0000 0000 7757 3d30 2340 0018 b0f8 2938 006c 0018 6294
4074640  5d10 0000 0200 0ad7 6840 69b0 4714 4790 001c 39f8 0012 07f8 0024 37f0 32f0 0020 24d0 0000 0012 0e80 0024 3c9c 0000 0020
4074720  0012 73cc 0024 3348 40b4 0020 0012 0838 0020 3984 0018 001c 38e8 41fc 0000 7757 3d3c 43c0 0200 0ad7 6d80 6d3c 242c 0000
4075000  0018 b0f8 28c4 0054 0018 b130 45b8 4700 477c 39a4 0012 07d8 0020 37dc 32f0 001c 24d0 0000 0012 0acc 0020 3c9c 0000 001c
4075060  0012 73cc 0020 332c 40b4 001c 0012 0aec 001c 3968 0018 38d4 4268 0000 0000 7757 3d30 2340 0018 b0f8 2938 006c 0018 6354
4075140  5d10 0000 0200 0ad7 6840 69b0 4714 4790 001c 39f8 0012 07d8 0024 37f0 32f0 0020 24d0 0000 0012 0acc 0024 3c9c 0000 0020
4075220  0012 73cc 0024 3348 40b4 0020 0012 0aec 0020 3984 0018 001c 38e8 41fc 0000 7757 3d3c 43c0 0200 0ad7 6d80 6d3c 242c 0000
4075300  0018 b0f8 28c4 0078 0018 63cc 45b8 4700 477c 39a4 0012 4e9c 0028 37dc 32f0 0024 24d0 0000 000b 09b0 0028 3380 001c 3c9c
4075360  0000 0024 0012 04e8 0028 3380 0020 411c 0000 0024 0012 0938 0024 332c 447c 0000 0200 0daf 6e1c 0020 6e1c 001c 24d0 0000
4075440  0018 b168 001c 3969 0018 38d4 4268 0000 0000 8067 3d30 2340 0018 b0f8 28c4 0034 0018 b178 45b8 46ec 4768 39a4 0012 5010
4075520  0018 394c 0018 38c0 4268 0000 0000 7757 4254 0000 0000 3077 2420 0000 0018 b0f8 2938 004c 0018 644c 5d10 0000 0200 0ad7
4075600  6840 69b0 4700 477c 3ba0 0000 0012 5010 001c 3968 0018 38d4 4268 0000 0000 7757 4254 0000 0000 3077 447c 0000 0200 0ad7
4075660  6d80 6d3c 242c 0000 0018 b0f8 2954 0278 0002 438a 4550 6b48 5370 4538 4b8c 0000 0000 0373 5370 4568 4b8c 0000 0000 03f3
4075740  6b74 4538 4b8c 0000 0000 0173 6bf4 4568 4b8c 0000 0000 03bb 6b74 4538 4b8c 0000 0000 03f3 6bf4 4568 4b8c 0000 0000 0103
4076020  6b74 4538 4b8c 0000 0000 032b 6bf4 4568 4b8c 0000 0000 0323 6b74 4538 4b8c 0000 0000 037b 6bf4 4568 4b8c 0000 0000 0373
4076100  6b74 4538 4b8c 0000 0000 0103 6bf4 4568 4b8c 0000 0000 03cb 6b74 4538 4b8c 0000 0000 030b 6bf4 4568 4b8c 0000 0000 0363
4076160  6b74 4538 4b8c 0000 0000 0383 6bf4 4568 4b8c 0000 0000 039b 6b74 4538 4b8c 0000 0000 034b 6bf4 4568 4b8c 0000 0000 0323
4076240  6b74 4538 4b8c 0000 0000 0103 6bf4 4568 4b8c 0000 0000 037b 6b74 4538 4b8c 0000 0000 03a3 6bf4 4568 4b8c 0000 0000 0103
4076320  6b74 4538 4b8c 0000 0000 03bb 6bf4 4568 4b8c 0000 0000 037b 6b74 4538 4b8c 0000 0000 0343 6bf4 4568 4b8c 0000 0000 0103
4076400  6b74 4538 4b8c 0000 0000 03bb 6bf4 4568 4b8c 0000 0000 037b 6b74 4538 4b8c 0000 0000 0373 6bf4 4568 4b8c 0000 0000 035b
4076460  6b74 4538 4b8c 0000 0000 0103 6bf4 4568 4b8c 0000 0000 03a3 6b74 4538 4b8c 0000 0000 013b 6bf4 4568 4b8c 0000 0000 0373
4076540  6b74 4538 4b8c 0000 0000 037b 6bf4 4568 4b8c 0000 0000 0223 6b74 4538 4b8c 0000 0000 0103 6bf4 4568 4b8c 0000 0000 01d3
4076620  6b74 4538 4b8c 0000 0000 033b 6bf4 4568 4b8c 0000 0000 0373 6b74 4538 4b8c 0000 0000 034b 6bf4 4568 4b8c 0000 0000 0373
4076700  6b74 4538 4b8c 0000 0000 0393 6bf4 4568 4b8c 0000 0000 030b 6b74 4538 4b8c 0000 0000 02bb 6bf4 4568 4b8c 0000 0000 0103
4076760  6b74 4538 4b8c 0000 0000 0153 6bf4 4568 4b8c 0000 0000 0153 6b74 4538 4b8c 0000 0000 0153 6bf4 4568 4b8c 0000 0000 0373
4077040  6b74 4538 4b8c 0000 0000 03f3 6bf4 22bc 0008 c0fc 0018 6740 0000 0070 b27c b66c 0000 1194 0000 11c0 0018 6744 0200 0db5
4077120  0500 1cdd 0000 8027 0000 000b 0000 3287 00c5 77e3 0000 0423 0000 315f 0018 6740 0000 0038 b27c b66c 0000 11a0 0000 11cc
4077200  0018 6fdc 0200 0db5 0500 1cdd 0000 80af 0000 0013 0000 3287 00c5 ad63 0000 0423 0000 315f 0003 6466 6700 a161 0018 6ab8
4077260  0000 0038 b27c b66c 0000 1195 0000 11c1 0018 6abc 0200 0db5 0500 1cdd 0000 8027 0000 0013 0000 3287 00c5 7cc3 0000 0423
4077340  0000 315f 27f0 005c 0018 67d0 45b8 46ec 2ba0 0014 000e 39a4 0012 07d8 0014 2c88 001e 2c30 000e 39a4 0012 07f8 0014 2c88
4077420  000e 2c58 3b4c 0000 0012 5010 0014 39f8 0012 4e9c 0014 37f0 447c 0000 0200 0ad7 6d0c 4af9 0000 246f 242c 0000 0018 b224
4077500  28c4 005c 0018 b234 45b8 46ec 3b4c 0000 0012 4e9c 0014 2ba0 0014 0010 3ba0 0000 0012 07d8 0014 2c88 001e 2c30 000e 39f8
4077560  0012 07f8 0014 2c88 000e 2c58 3ba0 0000 0012 5010 0014 43e4 0200 0ad7 6d50 4af8 0000 555f 2420 0000 0018 b224 2954 0288
4077640  0002 438a 4568 6b88 5370 4550 6b48 6bf4 4568 4af8 0000 0373 5370 4538 4b8c 0000 0000 03f3 6bf4 4568 4b8c 0000 0000 0173
4077720  6b74 4538 4b8c 0000 0000 030b 6bf4 4568 4b8c 0000 0000 03f3 6b74 4538 4b8c 0000 0000 0103 6bf4 4568 4b8c 0000 0000 037b
4100000  6b74 4538 4b8c 0000 0000 03a3 6bf4 4568 4b8c 0000 0000 0103 6b74 4538 4b8c 0000 0000 030b 6bf4 4568 4b8c 0000 0000 03f3
4100060  6b74 4538 4b8c 0000 0000 0103 6bf4 4568 4b8c 0000 0000 03a3 6b74 4538 4b8c 0000 0000 031b 6bf4 4568 4b8c 0000 0000 032b
4100140  6b74 4538 4b8c 0000 0000 0373 6bf4 4568 4b8c 0000 0000 0373 6b74 4538 4b8c 0000 0000 037b 6bf4 4568 4b8c 0000 0000 031b
4100220  6b74 4538 4b8c 0000 0000 0103 6bf4 4568 4b8c 0000 0000 037b 6b74 4538 4b8c 0000 0000 03a3 6bf4 4568 4b8c 0000 0000 0103
4100300  6b74 4538 4b8c 0000 0000 03bb 6bf4 4568 4b8c 0000 0000 037b 6b74 4538 4b8c 0000 0000 0343 6bf4 4568 4b8c 0000 0000 0103
4100360  6b74 4538 4b8c 0000 0000 03bb 6bf4 4568 4b8c 0000 0000 037b 6b74 4538 4b8c 0000 0000 0373 6bf4 4568 4b8c 0000 0000 035b
4100440  6b74 4538 4b8c 0000 0000 0103 6bf4 4568 4b8c 0000 0000 03a3 6b74 4538 4b8c 0000 0000 013b 6bf4 4568 4b8c 0000 0000 0373
4100520  6b74 4538 4b8c 0000 0000 037b 6bf4 4568 4b8c 0000 0000 0223 6b74 4538 4b8c 0000 0000 0103 6bf4 4568 4b8c 0000 0000 01d3
4100600  6b74 4538 4b8c 0000 0000 033b 6bf4 4568 4b8c 0000 0000 0373 6b74 4538 4b8c 0000 0000 034b 6bf4 4568 4b8c 0000 0000 0373
4100660  6b74 4538 4b8c 0000 0000 0393 6bf4 4568 4b8c 0000 0000 030b 6b74 4538 4b8c 0000 0000 02bb 6bf4 4568 4b8c 0000 0000 0103
4100740  6b74 4538 4b8c 0000 0000 0153 6bf4 4568 4b8c 0000 0000 0153 6b74 4538 4b8c 0000 0000 0153 6bf4 4568 4b8c 0000 0000 0373
```

```
4101020  6b74 4538 4b8c 0000 0000 03f3 6bf4 22bc 0008 c0fc 0018 6b70 0000 0070 b27c b66c 0000 1196 0000 11c2 0018 6af4 0200 0db5
4101100  0500 1cdd 0000 802f 0000 0013 0000 3287 00c5 79c3 0000 0423 0000 315f 0018 6b70 0000 0038 b27c b66c 0000 1197 0000 11c3
4101160  0018 6b74 0200 0db5 0500 1cdd 0000 802f 0000 001b 0000 3287 00c5 9483 0000 0423 0000 315f 2954 0048 0002 438a 56f8 671c
4101240  682c 4714 4768 3380 001c 247c 0008 c83c 0020 aa88 001c aa6c a4bc 0010 3df4 001c 318c 4a7c 0010 2c88 000a 37b0 318c 4a7c
4101320  0010 2ecc 23fc 0000 0018 b290 0018 6c34 0000 0070 b27c b66c 0000 1198 0000 11c4 0018 6bac 0200 0db5 0500 1cdd 0000 8077
4101400  0000 0013 0000 3287 00c5 97e3 0000 0423 0000 315f 0018 6c34 0000 0038 b27c b66c 0000 1199 0000 11c5 0018 6c38 0200 0db5
4101460  0500 1cdd 0000 8077 0000 001b 0000 3287 00c5 9a03 0000 0423 0000 315f 2954 0054 0002 438a 56f8 687c 0020 69b0 4714 4768
4101540  3380 0024 3b4c 0000 000e 4a50 0028 3410 001c 3e70 0024 3c9c 0000 0020 0018 b3ac 0020 33bc 3e70 001c 3c48 0000 000c 4118
4101620  0018 2ecc 386c 3130 2420 0000 0018 b340 0018 6ce8 0000 0070 b27c b66c 0000 119a 0000 11c6 0018 6c70 0200 0db5 0500 1cdd
4101700  0000 807f 0000 001b 0000 3287 00c5 9d63 0000 0423 0000 315f 0018 6ce8 0000 0038 b27c b66c 0000 119b 0000 11c7 0018 6cec
4101760  0200 0db5 0500 1cdd 0000 8087 0000 0023 0000 3287 00c5 a023 0000 0423 0000 315f 2954 0044 0002 438a 56f8 671c 682c 46ec
4102040  4790 001c 47e4 3410 0020 37f0 24d0 0000 0018 b484 0024 33d8 3e70 0020 3af4 001c 000c 4118 001c 2ecc 38e8 3d6c 2410 0000
4102120  0018 b404 0018 6d54 0000 0038 b27c b66c 0000 119c 0000 11c8 0018 6d58 0200 0db5 0500 1cdd 0000 809f 0000 001b 0000 3287
4102200  00c5 a423 0000 0423 0000 315f 28c4 0034 0018 b4f4 45b8 5758 6750 6a00 57b8 671c 6a50 5aec 0200 0ad7 6d0c 6bb4 3b4c 0000
4102260  0018 b4e4 0018 2ecc 23fc 0000 0018 b484 0018 6ea4 0000 0038 b27c b66c 0000 119d 0000 11c9 0018 6ea8 0200 0db5 0500 1cdd
4102340  0000 8097 0000 0013 0000 3287 00c5 a723 0000 0423 0000 315f 27f0 0074 0018 6dfc 45c4 46d8 2ba0 0014 0010 39f8 0012 07d8
4102420  0014 2ecc 2c88 0048 2c30 0012 3ba0 0000 0012 07f8 0014 2ecc 2c88 0034 2c30 0012 3ba0 0000 0012 08b8 0014 2ecc 2c88 0020
4102500  2c30 0012 3ba0 0000 0012 5010 0014 2ecc 2c88 000c 2c58 39f8 0012 5080 0014 39a4 0012 4e9c 0014 2330 0018 b548 2954 00a4
4102560  0002 438a 45b8 46ec 3b4c 0000 0012 4e9c 001c 2e7c ae30 2ba0 001c 0026 3ba0 0000 0012 4e9c 001c aa6c 2e98 3348 3ba0 0000
4102640  0018 b548 0018 3d3c 2420 0000 0018 b58c 2c30 0012 3ba0 0000 0012 07d8 0014 2ecc 2c88 0048 2c30 0012 3ba0 0000 0012 07f8
4102720  0014 2ecc 2c88 0034 2c30 0012 3ba0 0000 0012 08b8 0014 2ecc 2c88 0020 2c30 0012 3ba0 0000 0012 5010 0014 2ecc 2c88 000c
4103000  2c58 39f8 0012 5080 0014 2330 0018 b5ac 0018 6fd8 0000 00f0 b27c b66c 0000 119e 0000 11ca 0018 6ee0 0200 0db5 0500 1cdd
4103060  0000 809f 0000 0013 0000 3287 00c5 aa43 0000 0423 0000 315f 0018 6f14 0000 0038 b27c b66c 0000 119f 0000 11cb 0018 6704
4103140  0200 0db5 0500 1cdd 0000 80a7 0000 0013 0000 3287 00c5 ac63 0000 0423 0000 315f 0018 6fd8 0000 0080 0018 b8b8 0018 b988
4103220  0018 b9ec 0018 bb54 0000 0000 0000 0000 0000 0000 0000 0000 0000 0000 0018 bbd8 0000 0000 0000 0000 0000 0000 0000 0000
4103300  0000 0000 0018 bd08 0000 0000 0018 b5bc 0018 b600 0018 b634 0018 b678 0018 b6c0 0018 b6f0 0018 b744 0000 0000 0018 b7d4
4103360  0018 b908 0000 0000 0000 0000 0000 0000 2c78 0044 0002 438a 2520 46ec 35c8 32d4 24d0 0000 0012 0508 001c 3348 4108 0000
4103440  000b 7b50 0018 3d3c 3280 247c 0012 0688 0014 39a4 0012 73cc 0014 37f0 3cf4 234c 0012 0734 0018 705c 0000 0038 b27c b66c
4103520  0000 11a1 0000 11cd 0018 7060 0200 0db5 0500 1cdd 0000 80b7 0000 001b 0000 3287 00c5 b343 0000 0423 0000 315f 2c78 004c
4103600  0002 438a 45e8 001c 46ec 4768 3af4 001c 0012 4e30 0020 382c 001c 32d4 24d0 0000 0012 0fe4 001c 3aa0 0012 1090 001c 3310
4103660  4108 0000 0012 36d4 0018 386c 37f0 3cf4 242c 0000 000b 64bc 0018 7104 0000 0038 b27c b66c 0000 11a2 0000 11ce 0018 7108
4103740  0200 0db5 0500 1cdd 0000 80bf 0000 0033 0000 3287 00c5 b583 0000 0423 0000 315f 2c78 0070 0002 438a 45e8 0024 4790 001c
4104020  47f8 0020 4864 0018 482c 001c 3894 0020 4300 0000 0000 695f 0013 37d8 0028 3880 382c 001c 3af4 0024 0018 b668 0024 33d8
4104100  382c 0020 4538 6e1c 001c 5370 24d0 0000 000c 4118 001c 33a0 4550 6dd8 5370 408c 000c 4118 0014 37f0 3cf4 234c 0018 b2fc
4104160  0018 724c 0000 03a8 b27c b66c 0000 11a3 0000 11cf 0018 7140 0200 0db5 0500 1cdd 0000 80c7 0000 0033 0000 3287 00c5 b703
4104240  0000 0423 0000 315f 0018 7174 0000 0038 b27c b66c 0000 11a4 0000 11d0 0018 7178 0200 0db5 0500 1cdd 0000 80cf 0000 0003
4104320  0000 3287 00c5 b9a3 0000 0423 0000 315f 0018 724c 0000 0038 b27c b66c 0000 11a5 0000 11d1 0018 7250 0200 0db5 0500 1cdd
4104400  0000 80df 0000 000b 0000 3287 00c5 be23 0000 0423 0000 315f 2c78 00a0 0002 438a 2520 3520 0018 3468 33bc 3310 24d0 0000
4104460  0018 b7f4 001c 2ecc 4300 0000 000c 771f 0008 ec1c 001c 247c 0008 d13c 001c 247c 0018 b814 001c 43e4 0400 767f 5f64 43c0
4104540  0200 0daf 4b8c 0000 0000 3287 6bb4 247c 0008 db9c 001c 43e4 0200 80f7 5f8c 43c0 0200 0daf 4b8c 0000 0000 3287 6bb4 247c
4104620  0008 db9c 001c 42ac 0000 80ff 0008 ec1c 001c 247c 0008 d13c 001c 3da8 3d6c 3d30 3cf4 234c 0018 adf0 0018 7310 0000 0038
4104700  b27c b66c 0000 11a6 0000 11d2 0018 7314 0200 0db5 0500 1cdd 0000 8107 0000 0013 0000 3287 00c5 c3c3 0000 0423 0000 315f
4104760  2c78 008c 0002 438a 45b8 46ec 2ba0 0014 001c 37f0 3b4c 0000 0012 ec89 0014 3228 320c 31f0 242c 0000 0012 f02c 2c58 42ac
4105040  0000 810f 0008 ec1c 0014 247c 0008 d13c 0014 43e4 0300 695f 5f78 43c0 0200 0daf 4b8c 0000 0000 3287 6bb4 247c 0008 db9c
4105120  0014 43e4 0200 696f 6d0c 5fa0 447c 0000 0200 0daf 4b8c 0000 0000 3287 6bb4 247c 0008 db9c 0014 2330 0012 ed70 0018 73e4
4105200  0000 0070 b27c b66c 0000 11a7 0000 11d3 0018 734c 0200 0db5 0500 1cdd 0000 8117 0000 002b 0000 3287 00c5 c543 0000 0423
4105260  0000 315f 0018 73e4 0000 0038 b27c b66c 0000 11a8 0000 11d4 0018 73e8 0200 0db5 0500 1cdd 0000 8117 0000 0033 0000 3287
4105340  00c5 c7c3 0000 0423 0000 315f 2c78 0064 0002 438a 45e8 0020 4728 001c 477c 47d0 482c 0018 4810 001c 44a0 0000 0600 80c7
4105420  6e1c 0020 5fb4 0014 447c 0000 0200 0daf 4b8c 0000 0000 3287 6bb4 247c 0008 db9c 0024 43c0 0600 80c7 6e1c 0020 6e1c 001c
4105500  6dd8 6d94 6d50 640c 242c 0000 0012 0c40 0018 74d8 0000 0070 b27c b66c 0000 11a9 0000 11d5 0018 7420 0200 0db5 0500 1cdd
4105560  0000 80e7 0000 002b 0000 3287 00c5 bfa3 0000 0423 0000 315f 0018 74d8 0000 0038 b27c b66c 0000 11aa 0000 11d6 0018 74dc
4105640  0200 0db5 0500 1cdd 0000 80e7 0000 0033 0000 3287 00c5 ca43 0000 0423 0000 315f 27f0 002c 0018 747c 36f4 0020 447c 0000
4105720  0600 80c7 6c48 0020 6b88 6bc8 6c08 6c48 0018 6c48 001c 22bc 0012 08d8 2954 0058 0002 438a 45b8 46ec 4768 47e4 4880 0018
4106000  001c 4880 001c 0020 3380 0024 3b4c 0000 0018 b878 0028 3984 001c 0020 3984 0018 001c 38e8 386c 3e70 0024 39a4 0018 b6b0
4106060  0024 3984 001c 0020 3984 0018 001c 2304 0018 b9f8 0018 753c 0000 0038 b27c b66c 0000 11ab 0000 11d7 0018 7540 0200 0db5
```

```
4106140  0500 1cdd 0000 811f 0000 002b 0000 3287 00c5 cbc3 0000 0423 0000 315f 2c78 002c 0002 438a 36f4 001c 447c 0000 0600 80c7
4106220  6c48 001c 5fa0 6b88 6bc8 6c08 6c48 0018 239c 0000 0012 738c 0018 75a0 0000 0038 b27c b66c 0000 11ac 0000 11d8 0018 75a4
4106300  0200 0db5 0500 1cdd 0000 811f 0000 0033 0000 3287 00c5 cd43 0000 0423 0000 315f 2c78 002c 0002 438a 36f4 0020 447c 0000
4106360  06c0 80c7 6c48 0020 6b88 6bc8 6c08 6c48 0018 6c48 001c 22bc 0012 738c 0018 7604 0000 0038 b27c b66c 0000 11ad 0000 11d9
4106440  0018 7608 0200 0db5 0500 1cdd 0000 8127 0000 000b 0000 3287 00c5 cee3 0000 0423 0000 315f 2938 002c 0018 ad50 5d10 0000
4106520  0200 0ad7 6840 5fa0 37f0 3280 24d0 0000 0012 50f0 0014 37f0 3cf4 234c 0018 ba2c 0018 76c8 0000 0038 b27c b66c 0000 11ae
4106600  0000 11da 0018 76cc 0200 0db5 0500 1cdd 0000 8127 0000 0013 0000 3287 00c5 d163 0000 0423 0000 315f 2c78 008c 0002 438a
4106660  45b8 46ec 44a0 0000 0100 3d4f 6d0c 32b8 24d0 0000 0008 cf7c 0018 4408 0200 3d5f 4b8c 0000 0000 0c83 4b8c 0000 0000 0643
4106740  4254 0000 0000 3d5f 3bf4 0000 0008 dd9c 0018 41e8 0000 2ae7 3bf4 0000 0008 dd5c 0018 41e8 0000 3d67 3bf4 0000 0008 dd5c
4107020  0018 3d6c 37f0 39a4 0018 baac 0014 4408 0100 0e4f 4b8c 0000 0000 8137 2410 0000 0018 bacc 0018 78bc 0000 0038 b27c b66c
4107100  0000 11af 0000 11db 0018 78c0 0200 0db5 0500 1cdd 0000 8127 0000 001b 0000 3287 00c5 d563 0000 0423 0000 315f 2938 00c8
4107160  0018 77c4 4e1c 0000 0000 5ebf 2520 4728 0020 4754 37f0 43c0 0200 0daf 4b8c 0000 0000 61bf 6e1c 0020 24d0 0000 0016 46ac
4107240  0024 382c 0020 32b8 24d0 0000 0012 0508 0020 3a4c 0012 7690 0020 3380 001c 3a4c 0012 04e8 0020 37f0 447c 0000 0200 0daf
4107320  4b8c 0000 0000 813f 6e1c 001c 24d0 0000 0016 46ac 001c 3364 3bf4 0000 0012 0548 001c 37f0 447c 0000 0200 0daf 4b8c 0000
4107400  0000 8147 6dd8 247c 0016 46ac 0018 3310 40f4 0000 0012 0568 0014 37f0 447c 0000 0200 0daf 4b8c 0000 0000 814f 6d0c 234c
4107460  0016 46ac 28c4 00f4 0018 bb18 4e1c 0000 0000 32e7 2520 4728 0024 4754 382c 0024 32b8 247c 0012 0acc 0028 37f0 447c 0000
4107540  0200 0daf 4b8c 0000 0000 61bf 6e1c 0024 24d0 0000 0016 46ac 0024 3a4c 0012 7714 0024 3380 0020 3a4c 0012 0aec 0024 37f0
4107620  447c 0000 0200 0daf 4b8c 0000 0000 2927 6e1c 0020 24d0 0000 0016 46ac 0020 3380 001c 3a4c 0012 42d4 0020 37f0 447c 0000
4107700  0200 0daf 4b8c 0000 0000 53a7 6e1c 001c 24d0 0000 0016 46ac 001c 3364 3bf4 0000 0012 4354 001c 37f0 447c 0000 0200 0daf
4107760  4b8c 0000 0000 8157 6dd8 247c 0016 46ac 0018 3310 40f4 0000 0012 0b0c 0014 37f0 447c 0000 0200 0daf 4b8c 0000 0000 6287
4110040  6d0c 234c 0016 46ac 0018 7964 0000 0038 b27c b66c 0000 11b0 0000 11dc 0018 7968 0200 0db5 0500 1cdd 0000 812f 0000 001b
4110120  0000 3287 00c5 d663 0000 0423 0000 315f 2938 0034 0018 7924 4e1c 0000 0000 5ebf 2520 4740 32b8 247c 000b 09b0 0018 332c
4110200  40f4 0000 0012 3e20 0014 3d30 2420 0000 0018 bb7c 28c4 003c 0018 ad14 4e1c 0000 0000 32e7 2520 4740 32b8 247c 0012 0acc
4110260  0018 3a4c 0012 7714 0018 332c 40f4 0000 0012 446c 0014 3d30 2420 0000 0018 bb7c 0018 7a1c 0000 0038 b27c b66c 0000 11b1
4110340  0000 11dd 0018 7a20 0200 0db5 0500 1cdd 0000 815f 0000 0013 0000 3287 00c5 dbe3 0000 0423 0000 315f 2c78 0052 0002 438a
4110420  45b8 46ec 9314 9460 0040 2e7c adec 2ba0 0018 0014 3b4c 0000 0008 d33c 0018 aa50 2e98 2c88 0012 2c58 320c 42ac 0000 816f
4110500  0018 bbf8 0014 3958 4254 0000 0000 8177 2420 0000 0008 dd9c 22a0 206c 0000 002c 0011 773c b27c b66c 0000 11b2 7fff ffff
4110560  0018 c458 0200 0db5 0200 24b1 0000 3287 0000 39cf 0000 315f 0018 7a8c 0000 0038 b130 b66c 0000 11b3 0000 11de 0018 5d05
4110640  0200 0db5 0500 1cdd 0000 768f 0000 0013 0000 3287 00b2 3563 0000 0423 0000 315f 2c78 0038 0002 438a 2520 46d8 332c 247c
4110720  0018 b168 0014 3d60 4254 0000 0000 1d17 3b4c 0000 0008 dd9c 0010 41e8 0000 3de7 2420 0000 0008 dd5c 0018 7f88 0000 01ec
4111000  6574 2c20 616e 6420 5265 7369 6475 6520 7769 7468 2061 206c 6973 7420 6f66 2061 6c6c 2074 6865 206f 7468 6572 2065 6c65
4111060  6d65 6e74 732e 0a0a 7365 6c65 6374 5f6d 696e 2845 6c65 6165 6e74 2c20 5365 742c 2052 6573 6964 7565 2920 3a2d 0a09 7365
4111140  6c5f 6d69 6e5f 7472 6d28 5365 742c 2052 6573 6964 7565 2c20 456c 656d 656e 7429 2e0a 0a0a 7365 6c5f 6d69 6e5f 7472 6d28
4111220  5b48 6561 647c 5461 696c 5d2c 2052 6573 6964 7565 2c20 456c 656d 656e 7429 203a 2d0a 0973 656c 5f6d 696e 5f74 726d 285b
4111300  4865 6164 7c54 6169 6c5d 2c20 5265 7369 6475 652c 2048 6561 642c 204c 6973 7431 2c20 5265 7369 6475 6531 292c 0a09 212c
4111360  0a09 7365 6c5f 6d69 6e5f 7472 6d28 4c69 7374 312c 2052 6573 6964 7565 312c 2045 6c65 6d65 6e74 292e 0a73 656c 5f6d 696e
4111440  5f74 726d 285b 4865 6164 7c54 6169 6c5d 2c20 5461 696c 2c20 4865 6164 292e 0a0a 0a73 656c 5f6d 696e 5f74 726d 285b 5d2c
4111520  205f 2c20 5f2c 205f 2c20 5f29 203a 2d20 212c 2066 6169 6c2e 0a73 656c 5f6d 696e 5f74 726d 285b 4865 6164 7c54 6169 6c5d
4111600  2c20 5b48 6561 647c 5265 7369 6475 655d 2c20 4375 7272 656e 742c 204c 6973 7431 2c20 5265 7369 6475 6531 2920 3a2d 0a09
4111660  4375 7272 656e 7420 403d 3c20 4865 6164 2c0a 0921 2c0a 0973 656c 5f6d 696e 5f74 7261 2854 6169 6c2c 2052 6573 6964 7565
4111740  2c20 4375 0000 7f77 b328 7c7c 0011 776c 0000 0000 0000 7f77 b464 af5d 0011 7798 0017 f4ac 0018 3b94 0200 7f77 0000 7f77
4112020  0000 0008 0018 1754 0018 1754 0001 0085 0000 0000 0012 0014 0200 7f9f 0000 7f77 0000 0008 0018 a27c 0018 a27c 0001 0085
4112100  0000 0000 0000 7f9f b464 0000 0018 1e2c 0017 f4a0 0014 0a88 0200 6cd7 0000 7f77 0000 0008 0018 a350 0018 a350 0001 0085
4112160  0000 0000 0000 6cd7 b464 0000 0018 1e60 0017 a774 0018 7cb4 0300 7f9f 0000 7f77 0000 000c 0018 a434 0018 a434 0001 0085
4112240  0000 0000 0018 7ce4 0300 6cd7 0000 7f77 0000 000c 0018 a4fc 0018 a4fc 0001 0085 0000 0000 0016 4af4 0300 778f 0000 7f77
4112320  0000 000c 0018 a820 0018 a820 0001 0085 0000 0000 0000 778f b464 0000 0018 1efc 0018 7da4 0018 7d54 0400 778f 0000 7f77
4112400  0000 0010 0018 a940 0018 a940 0001 0085 0000 0000 b464 0000 0018 1f30 0000 0000 0014 7fcc 0300 7fa7 0000 7f77 0000 000c
4112460  0018 a5d8 0018 a5d8 0001 0085 0000 0000 0000 7fa7 b464 0000 0018 1f64 0018 7e00 0018 7db0 0400 7fa7 0000 7f77 0000 0010
4112540  0018 a6d8 0018 a6d8 0001 0085 0000 0000 b464 0000 0018 1f98 0000 0000 0009 6f72 6465 7265 645f 3000 0009 6f72 6465 7265
4112620  645f 3100 000c 6d61 785f 6d65 6d62 6572 5f31 0000 000c 6d69 6e5f 6d65 6d62 6572 5f31 0000 000b 7365 6c5f 6d69 6e5f 6765
4112700  6e00 0000 000b 7365 6c5f 6d61 785f 6765 6e00 0000 0200 7f77 b328 0000 0018 1fcc 0000 0000 0200 7faf b328 0000 0018 2000
4112760  0000 0000 0018 7e74 0013 7f9c 0300 7fb7 b328 0000 0018 2034 0000 0000 0300 7f9f b328 0000 0018 206c 0000 0000 0400 7fbf
4113040  b328 0000 0018 20a4 0000 0000 0300 6cd7 b328 0000 0018 20e0 0000 0000 0400 7fc7 b328 0000 0018 2118 0000 0000 000a 2418
4113120  0000 0000 0018 7ecc 0018 7edc 0400 7fa7 b328 0000 0018 2154 0000 0000 000a 23f8 0000 0000 0018 7eec 0018 7efc 0400 7fcf
4113200  b328 0000 0018 2190 0000 0000 0600 7fcf b328 0000 0018 21cc 0000 0000 0018 7f0c 0000 0000 0018 7f1c 0018 7f2c 0400 778f
```

| | | | | | | | | | | | | | | | | | | | | | | | | |
|---|---|---|---|---|---|---|---|---|---|---|---|---|---|---|---|---|---|---|---|---|---|---|---|---|
| 4113260 | b328 | 0000 | 0018 | 2210 | 0000 | 0000 | 0018 | 7f3c | 000a | 209c | 0400 | 7fd7 | b328 | 0000 | 0018 | 224c | 0000 | 0000 | 0600 | 7fd7 | b328 | 0000 | 0018 | 2288 |
| 4113340 | 0000 | 0000 | 0018 | 7f54 | 0000 | 0000 | 0018 | 7f64 | 0018 | 7f74 | 0018 | be4c | 0000 | 2008 | 0018 | b8b8 | 0018 | b988 | 0018 | b9ec | 0018 | bb54 | 0000 | 0000 |
| 4113420 | 0000 | 0000 | 0000 | 0000 | 0000 | 0000 | 0000 | 0000 | 0018 | bbd8 | 0018 | b908 | 0000 | 0000 | 0000 | 0000 | 0000 | 0000 | 0018 | a47c | 0000 | 1fc8 | 2f31 | 392f |
| 4113500 | 3838 | 0a25 | 2020 | 2044 | 6566 | 696e | 6573 | 3a20 | 6170 | 706c | 792f | 3220 | 616e | 6420 | 7365 | 7665 | 7261 | 6c20 | 6172 | 6974 | 6965 | 7320 | 6f66 | 2063 |
| 4113560 | 616c | 6c2f | 4e0a | 0a25 | 2020 | 2041 | 6461 | 7074 | 6564 | 2066 | 726f | 6d20 | 7368 | 6172 | 6564 | 2063 | 6f64 | 6520 | 7772 | 6974 | 7465 | 6e20 | 6279 | 2074 |
| 4113640 | 6865 | 2073 | 616d | 6520 | 6175 | 7468 | 6f72 | 3b20 | 616c | 6c20 | 6368 | 616e | 6765 | 730a | 2520 | 2020 | 436f | 7079 | 7269 | 6768 | 7420 | 2843 | 2920 | 3139 |
| 4113720 | 3837 | 2c20 | 5175 | 696e | 7475 | 7320 | 436f | 6d70 | 7574 | 6572 | 2053 | 7973 | 7465 | 6d73 | 2c20 | 496e | 632e | 2020 | 416c | 6c20 | 7269 | 6768 | 7473 | 2072 |
| 4114000 | 6573 | 6572 | 7665 | 642e | 0a0a | 3a2d | 206d | 6f64 | 756c | 6528 | 6361 | 6c6c | 2c20 | 5b0a | 0961 | 7070 | 6c79 | 2f32 | 2c0a | 0963 | 616c | 6c2f | 322c | 0a09 |
| 4114060 | 6361 | 6c6c | 2f33 | 2c0a | 0963 | 616c | 6c2f | 342c | 0a09 | 6361 | 6c6c | 2f35 | 2c0a | 0963 | 616c | 6c2f | 362c | 0a09 | 6361 | 6c6c | 2f37 | 2c0a | 0973 | 7472 |
| 4114140 | 6970 | 5f6d | 6f64 | 756c | 655f | 7072 | 6566 | 6978 | 2f34 | 0925 | 3c2d | 2d2d | 2d2d | 2d2d | 2066 | 6f72 | 2074 | 6865 | 2049 | 5043 | 2063 | 6f64 | 6520 | 4f4e |
| 4114220 | 4c59 | 210a | 2020 | 205d | 292e | 0a3a | 2d20 | 6d65 | 7461 | 5f70 | 7265 | 6469 | 6361 | 7465 | 0a09 | 6170 | 706c | 7928 | 3a2c | 202b | 292c | 0a09 | 6361 | 6c6c |
| 4114300 | 2831 | 2c20 | 3f29 | 2c0a | 0963 | 616c | 6c28 | 322c | 203f | 2c20 | 3f29 | 2c0a | 0963 | 616c | 6c28 | 332c | 203f | 2c20 | 3f2c | 203f | 292c | 0a09 | 6361 | 6c6c |
| 4114360 | 2834 | 2c20 | 3f2c | 203f | 2c20 | 3f2c | 203f | 292c | 0a09 | 6361 | 6c6c | 2835 | 2c20 | 3f2c | 203f | 2c20 | 3f2c | 203f | 2c20 | 3f29 | 2c0a | 0963 | 616c | 6c28 |
| 4114440 | 362c | 203f | 2c20 | 3f2c | 203f | 2c20 | 3f2c | 203f | 2c20 | 3f29 | 2e0a | 0a3a | 2d20 | 6d6f | 6465 | 0a09 | 6170 | 7065 | 6e64 | 5f74 | 6572 | 6d28 | 2b2c | 202b |
| 4114520 | 2c20 | 2d29 | 2c0a | 0961 | 7070 | 656e | 645f | 7465 | 726d | 3128 | 2b2c | 202b | 2c20 | 2b29 | 2c0a | 0961 | 7070 | 656e | 645f | 7465 | 726d | 3228 | 2b2c | 202b |
| 4114600 | 2c20 | 2b29 | 2c0a | 0961 | 7070 | 656e | 645f | 7465 | 726d | 282b | 2c20 | 2b2c | 202d | 2c20 | 2d29 | 2c0a | 0961 | 7070 | 6c79 | 282b | 2c20 | 2b29 | 2c0a | 0963 |
| 4114660 | 616c | 6c28 | 2b2c | 203f | 292c | 0a09 | 6361 | 6c6c | 282b | 2c20 | 3f2c | 203f | 292c | 0a09 | 6361 | 6c6c | 282b | 2c20 | 3f2c | 203f | 2c20 | 3f29 | 2c0a | 0963 |
| 4114740 | 616c | 6c28 | 2b2c | 203f | 2c20 | 3f2c | 203f | 2c20 | 3f29 | 2c0a | 0963 | 616c | 6c28 | 2b2c | 203f | 2c20 | 3f2c | 203f | 2c20 | 3f2c | 203f | 292c | 0a09 | 6361 |
| 4115020 | 6c6c | 282b | 2c20 | 3f2c | 203f | 2c20 | 3f2c | 203f | 2c20 | 3f2c | 203f | 292c | 0a09 | 7374 | 7269 | 705f | 6d6f | 6475 | 6c65 | 5f70 | 7265 | 6669 | 7828 | 2b2c |
| 4115100 | 202b | 2c20 | 2d2c | 202d | 292e | 0a0a | 7363 | 6373 | 5f69 | 6428 | 2722 | 4028 | 2329 | 3838 | 2f30 | 392f | 3139 | 2063 | 616c | 6c2e | 706c | 0932 | 372e | 3122 |
| 4115160 | 2729 | 2e0a | 0a2f | 2a20 | 7072 | 6564 | 0a09 | 6170 | 706c | 7928 | 616e | 792c | 206c | 6973 | 7428 | 616e | 7929 | 292c | 0909 | 2520 | 6173 | 2063 | 6c6f | 7365 |
| 4115240 | 2061 | 7320 | 7765 | 2063 | 616e | 2067 | 6574 | 0a09 | 6361 | 6c6c | 2876 | 6f69 | 6428 | 4129 | 2c20 | 4129 | 2c0a | 0963 | 616c | 6c28 | 766f | 6964 | 2841 | 2c42 |
| 4115320 | 292c | 2041 | 2c20 | 4229 | 2c0a | 0963 | 616c | 6c28 | 766f | 6964 | 2841 | 2c42 | 2c43 | 292c | 2041 | 2c20 | 422c | 2043 | 292c | 0a09 | 6361 | 6c6c | 2876 | 6f69 |
| 4115400 | 6428 | 412c | 422c | 432c | 4429 | 2c20 | 412c | 2042 | 2c20 | 432c | 2044 | 292c | 0a09 | 6361 | 6c6c | 2876 | 6f69 | 6428 | 412c | 422c | 432c | 442c | 4529 | 2c20 |
| 4115460 | 412c | 2042 | 2c20 | 432c | 2044 | 2c20 | 4529 | 2c0a | 0963 | 616c | 6c28 | 766f | 6964 | 2841 | 2c42 | 2c43 | 2c44 | 2c45 | 2c46 | 292c | 2041 | 2c20 | 422c | 2043 |
| 4115540 | 2c20 | 442c | 2045 | 2c20 | 4629 | 2e0a | 2a2f | 0a0a | 2525 | 2020 | 7374 | 7269 | 705f | 6d6f | 6475 | 6c65 | 5f70 | 7265 | 6669 | 7828 | 2b54 | 6572 | 6d2c | 202b |
| 4115620 | 4465 | 6661 | 756c | 744d | 6f64 | 756c | 652c | 202d | 476f | 616c | 2c20 | 2d4d | 6f64 | 756c | 6529 | 0a25 | 2020 | 2069 | 7320 | 6769 | 7665 | 6e20 | 6120 | 5465 |
| 4115700 | 726d | 2061 | 6e64 | 2061 | 2064 | 6566 | 6175 | 6c74 | 206d | 6f64 | 756c | 652c | 2061 | 6e64 | 2072 | 6574 | 7572 | 6e73 | 2074 | 6865 | 2054 | 6572 | 6d0a | 2520 |
| 4115760 | 2020 | 6173 | 2061 | 2047 | 6f61 | 6c20 | 7769 | 7468 | 2061 | 6c6c | 206d | 6f64 | 756c | 6520 | 7072 | 6566 | 6978 | 6573 | 2073 | 7472 | 6970 | 7065 | 6420 | 6f66 |
| 4116040 | 6620 | 616e | 6420 | 7468 | 650a | 2520 | 2020 | 4d6f | 6475 | 6c65 | 2069 | 7420 | 6170 | 7065 | 6172 | 7320 | 746f | 2062 | 6520 | 6361 | 6c6c | 6564 | 2069 | 6e2e |
| 4116120 | 2020 | 284e | 6f74 | 6520 | 7468 | 6174 | 2074 | 6865 | 2063 | 616c | 6c65 | 640a | 2520 | 2020 | 7072 | 6564 | 6963 | 6174 | 6520 | 6d61 | 7920 | 6861 | 7665 | 2062 |
| 4116200 | 6565 | 6e20 | 6465 | 6669 | 6e65 | 6420 | 696e | 2073 | 6f6d | 6520 | 6f74 | 6865 | 7220 | 6d6f | 6475 | 6c65 | 2061 | 6e64 | 0a25 | 2020 | 2069 | 6d70 | 6f72 | 7465 |
| 4116260 | 6429 | 2e20 | 2049 | 7420 | 6368 | 6563 | 6b73 | 2074 | 6861 | 7420 | 7468 | 6520 | 4d6f | 6475 | 6c65 | 2069 | 7320 | 616e | 2061 | 746f | 6d2c | 2061 | 6e64 | 2074 |
| 4116340 | 6861 | 740a | 2520 | 2020 | 7468 | 6520 | 476f | 616c | 2069 | 7320 | 6e6f | 7420 | 6120 | 7661 | 7269 | 6162 | 6c65 | 2e20 | 2049 | 7420 | 6973 | 206c | 6566 | 7420 |
| 4116420 | 746f | 2061 | 7070 | 656e | 645f | 7465 | 726d | 2f5b | 332c | 345d | 0a25 | 2020 | 2074 | 6f20 | 6368 | 6563 | 6b20 | 7468 | 6174 | 2074 | 6865 | 2047 | 6f61 | 6c20 |
| 4116500 | 6973 | 206e | 6f74 | 2061 | 206e | 756d | 6265 | 722c | 2061 | 7320 | 7468 | 6579 | 2068 | 6176 | 6520 | 746f | 2063 | 616c | 6c0a | 2520 | 2020 | 6675 | 6e63 | 746f |
| 4116560 | 722f | 3320 | 6f6e | 2074 | 6865 | 2047 | 6f61 | 6c20 | 616e | 7977 | 6179 | 2e20 | 204e | 6f74 | 6520 | 7468 | 6520 | 6861 | 636b | 2069 | 6e20 | 7468 | 6520 | 6669 |
| 4116640 | 7273 | 740a | 2520 | 2020 | 636c | 6175 | 7365 | 2077 | 6869 | 6368 | 206c | 6574 | 7320 | 7573 | 2075 | 7365 | 2069 | 6e64 | 6578 | 696e | 6720 | 746f | 2064 | 6f20 |
| 4116720 | 6120 | 6e6f | 6e76 | 6172 | 2f31 | 2074 | 6573 | 743a | 0a25 | 2020 | 2030 | 2069 | 7320 | 6e6f | 7420 | 6120 | 7661 | 6c69 | 6420 | 5465 | 726d | 2c20 | 616e | 6420 |
| 4117000 | 7769 | 6c6c | 2061 | 6c73 | 6f20 | 6361 | 7463 | 6820 | 7661 | 7269 | 6162 | 6c65 | 732c | 2077 | 6869 | 6368 | 0a25 | 2020 | 2061 | 7265 | 206e | 6f74 | 2076 | 616c |
| 4117060 | 6964 | 2054 | 6572 | 6173 | 2065 | 6974 | 6865 | 722e | 2020 | 5468 | 6973 | 2070 | 7265 | 6469 | 6361 | 7465 | 2069 | 7320 | 4558 | 5452 | 454d | 454c | 590a | 2520 |
| 4117140 | 2020 | 756e | 6c69 | 6b65 | 6c79 | 2074 | 6f20 | 7375 | 7276 | 6976 | 6520 | 696e | 746f | 2074 | 6865 | 206e | 6578 | 7420 | 7265 | 6c65 | 6173 | 652c | 2073 | 6f20 |
| 4117220 | 706c | 6561 | 7365 | 2064 | 6f20 | 6e6f | 740a | 2520 | 2020 | 7573 | 6520 | 6974 | 2069 | 6e20 | 796f | 7572 | 2070 | 726f | 6772 | 616d | 732e | 2020 | 4974 | 2069 |
| 4117300 | 7320 | 6578 | 706f | 7274 | 6564 | 2066 | 6f72 | 2074 | 6865 | 2073 | 616b | 6520 | 6f66 | 2074 | 6865 | 0a25 | 2020 | 2049 | 5043 | 2063 | 6f64 | 6520 | 616e | 6420 |
| 4117360 | 666f | 7220 | 7468 | 6174 | 206f | 6e6c | 792e | 0a0a | 7374 | 7269 | 705f | 6d6f | 6475 | 6c65 | 5f70 | 7265 | 6669 | 7828 | 302c | 205f | 2c20 | 5f2c | 205f | 2920 |
| 4117440 | 3a2d | 2021 | 2c0a | 0966 | 6169 | 6c2e | 0a73 | 7472 | 6970 | 5f6d | 6f64 | 756c | 655f | 7072 | 6566 | 6978 | 2850 | 7265 | 6669 | 783a | 5465 | 726d | 2c20 | 5f2c |
| 4117520 | 2047 | 6f61 | 6c2c | 204d | 6f64 | 756c | 6529 | 203a | 2d20 | 212c | 0a09 | 7374 | 7269 | 705f | 6d6f | 6475 | 6c65 | 5f70 | 7265 | 6669 | 7828 | 5465 | 726d | 2c20 |
| 4117600 | 5072 | 6566 | 6978 | 2c20 | 476f | 616c | 2c20 | 4d6f | 6475 | 6c65 | 292e | 0a73 | 7472 | 6970 | 5f6d | 6f64 | 756c | 655f | 7072 | 6566 | 6978 | 2847 | 6f61 | 6c2c |
| 4117660 | 204d | 6f64 | 756c | 652c | 2047 | 6f61 | 6c2c | 204d | 6f64 | 756c | 6529 | 203a | 2d0a | 096e | 6f6e | 7661 | 7228 | 476f | 616c | 292c | 0909 | 2520 | 7368 | 6f75 |
| 4117740 | 6c64 | 2062 | 6520 | 6361 | 6c6c | 6162 | 6c65 | 2847 | 6f61 | 6c29 | 0a09 | 6174 | 6f6d | 284d | 6f64 | 756c | 6529 | 2e0a | 0a0a | 0a25 | 2020 | 2061 | 7070 | 6c79 |
| 4120020 | 282b | 5072 | 6564 | 2c20 | 2b5b | 4172 | 6731 | 2c2e | 2e2e | 2c41 | 7267 | 6e5d | 290a | 2520 | 2020 | 6973 | 2074 | 6865 | 206b | 6579 | 2074 | 6f20 | 7468 | 6973 |
| 4120100 | 2077 | 686f | 6c65 | 206d | 6f64 | 756c | 652e | 2020 | 4974 | 2069 | 7320 | 6261 | 7369 | 6361 | 6c6c | 7920 | 6120 | 7661 | 7269 | 616e | 7420 | 6f66 | 0a25 | 2020 |
| 4120160 | 2063 | 616c | 6c2f | 3120 | 7768 | 6572 | 6520 | 736f | 6d65 | 206f | 6620 | 7468 | 6520 | 6172 | 6775 | 6d65 | 6e74 | 7320 | 6d61 | 7920 | 6265 | 2061 | 6c72 | 6561 |
| 4120240 | 6479 | 2069 | 6e20 | 7468 | 6520 | 5072 | 6564 | 2c0a | 2520 | 2020 | 616e | 6420 | 7468 | 6520 | 7265 | 7374 | 2061 | 7265 | 2070 | 6173 | 7365 | 6420 | 696e | 2074 |
| 4120320 | 6865 | 206c | 6973 | 7420 | 6f66 | 2041 | 7267 | 732e | 2020 | 5468 | 7573 | 0a25 | 2020 | 2061 | 7070 | 6c79 | 2866 | 6f6f | 2c20 | 5b58 | 2c59 | 5d29 | 2069 | 7320 |

| | | | | | | | | | | | | | | | | | | | | | | | | |
|---|---|---|---|---|---|---|---|---|---|---|---|---|---|---|---|---|---|---|---|---|---|---|---|---|
| 4120400 | 7468 | 6520 | 7361 | 6d65 | 2061 | 7320 | 6361 | 6c6c | 2866 | 6f6f | 2858 | 2c59 | 2929 | 2c20 | 616e | 640a | 2520 | 2020 | 6170 | 706c | 7928 | 666f | 6f28 | 5829 |
| 4120460 | 2c20 | 5b59 | 5d29 | 2069 | 7320 | 616c | 736f | 2074 | 6865 | 2073 | 616d | 6520 | 6173 | 2063 | 616c | 6c28 | 666f | 6f28 | 582c | 5929 | 292e | 2054 | 6865 | 0a25 |
| 4120540 | 2020 | 2061 | 6269 | 6c69 | 7479 | 2074 | 6f20 | 7061 | 7373 | 2067 | 6f61 | 6c73 | 2061 | 726f | 756e | 6420 | 7769 | 7468 | 2073 | 6f6d | 6520 | 6f66 | 2074 | 6865 |
| 4120620 | 6972 | 2028 | 696e | 6974 | 6961 | 6c29 | 0a25 | 2020 | 2061 | 7267 | 756d | 656e | 7473 | 2061 | 6c72 | 6561 | 6479 | 2066 | 696c | 6c65 | 6420 | 696e | 2069 | 7320 |
| 4120700 | 7768 | 6174 | 206d | 616b | 6573 | 2061 | 7070 | 6c79 | 2f32 | 2073 | 6f20 | 7573 | 6566 | 756c | 2e0a | 2520 | 2020 | 4265 | 6361 | 7573 | 6520 | 6f66 | 2074 | 6865 |
| 4120760 | 2063 | 6f73 | 7420 | 6f66 | 2063 | 6f6e | 7374 | 7275 | 6374 | 696e | 6720 | 7468 | 6520 | 6e65 | 7720 | 676f | 616c | 2c20 | 616e | 6420 | 6f66 | 206c | 6f6f | 6b69 |
| 4121040 | 6e67 | 0a25 | 2020 | 2075 | 7020 | 7468 | 6520 | 7072 | 6564 | 6963 | 6174 | 6520 | 6174 | 2072 | 756e | 2074 | 696d | 652c | 2061 | 7070 | 6c79 | 2061 | 6e64 | 2074 |
| 4121120 | 6865 | 2072 | 6f75 | 7469 | 6e65 | 7320 | 6261 | 7365 | 6420 | 6f6e | 2069 | 740a | 2520 | 2020 | 6172 | 6520 | 6e6f | 7420 | 7765 | 6c6c | 2074 | 686f | 7567 | 6874 |
| 4121200 | 206f | 662e | 2020 | 596f | 7520 | 7368 | 6f75 | 6c64 | 206e | 6f74 | 2075 | 7365 | 2061 | 7070 | 6c79 | 2f32 | 2069 | 6620 | 6f6e | 6520 | 6f66 | 0a25 | 2020 | 2074 |
| 4121260 | 6865 | 2063 | 616c | 6c2f | 4e20 | 7072 | 6564 | 6963 | 6174 | 6573 | 2063 | 616e | 2062 | 6520 | 7573 | 6564 | 2069 | 6e73 | 7465 | 6164 | 2e0a | 0a61 | 7070 | 6c79 |
| 4121340 | 2850 | 7265 | 642c | 2041 | 7267 | 7329 | 203a | 2d0a | 0973 | 7472 | 6970 | 5f6d | 6f64 | 756c | 655f | 7072 | 6566 | 6978 | 2850 | 7265 | 642c | 2075 | 7365 | 722c |
| 4121420 | 2046 | 6f72 | 6d2c | 204d | 6f64 | 756c | 6529 | 2c0a | 0961 | 7070 | 656e | 645f | 7465 | 726d | 2846 | 6f72 | 6d2c | 2041 | 7267 | 732c | 2047 | 6f61 | 6c29 | 2c0a |
| 4121500 | 0921 | 2c0a | 094d | 6f64 | 756c | 653a | 476f | 616c | 2e0a | 6170 | 706c | 7928 | 5072 | 6564 | 2c20 | 4172 | 6773 | 2920 | 3a2d | 0a09 | 666f | 726d | 6174 | 2875 |
| 4121560 | 7365 | 725f | 6572 | 726f | 722c | 2027 | 7e4e | 2120 | 6261 | 6420 | 6172 | 6775 | 6d65 | 6e74 | 7320 | 746f | 2061 | 7070 | 6c79 | 2f32 | 7e6e | 2120 | 476f | 616c |
| 4121640 | 3a20 | 7e71 | 7e6e | 272c | 0a09 | 095b | 6170 | 706c | 7928 | 5072 | 6564 | 2c41 | 7267 | 7329 | 5d29 | 2c0a | 0966 | 6169 | 6c2e | 0a0a | 0a25 | 2520 | 2061 | 7070 |
| 4121720 | 656e | 645f | 7465 | 726d | 282b | 5465 | 726d | 2c20 | 2b4d | 6f72 | 6541 | 7267 | 732c | 203f | 4675 | 6c6c | 5465 | 726d | 290a | 2520 | 2020 | 7461 | 6b65 | 7320 |
| 4122000 | 6120 | 6361 | 6c6c | 6162 | 6c65 | 2074 | 6572 | 6d20 | 5028 | 5831 | 2c2e | 2e2e | 2c58 | 6b29 | 2061 | 6e64 | 2061 | 206c | 6973 | 7420 | 6f66 | 2065 | 7874 | 7261 |
| 4122060 | 2061 | 7267 | 7564 | 656e | 7473 | 0a25 | 2020 | 205b | 586b | 2b31 | 2c2e | 2e2e | 2c58 | 6e5d | 2061 | 6e64 | 2072 | 6574 | 7572 | 6e73 | 2074 | 6865 | 2074 | 6572 |
| 4122140 | 6d20 | 5028 | 5831 | 2c2e | 2e2e | 2c58 | 6e29 | 2e20 | 2054 | 6869 | 7320 | 6973 | 2075 | 7365 | 6675 | 6c0a | 2520 | 2020 | 666f | 7220 | 6170 | 706c | 792f | 322c |
| 4122220 | 2061 | 6e64 | 2061 | 6c73 | 6f20 | 666f | 7220 | 6772 | 616d | 6d61 | 7220 | 7072 | 6570 | 726f | 6365 | 7373 | 6f72 | 7320 | 7768 | 6963 | 6820 | 6f66 | 7465 | 6e20 |
| 4122300 | 6861 | 7665 | 0a25 | 2020 | 2072 | 6561 | 736f | 6e20 | 746f | 2061 | 6464 | 2061 | 7267 | 756d | 656e | 7473 | 2074 | 6f20 | 736f | 6d65 | 7468 | 696e | 672e | 2020 |
| 4122360 | 4f6e | 6520 | 7265 | 6173 | 6f6e | 2066 | 6f72 | 2075 | 7369 | 6e67 | 2074 | 6869 | 730a | 2520 | 2020 | 726f | 7574 | 696e | 6520 | 6973 | 2074 | 6861 | 7420 | 6974 |
| 4122440 | 2074 | 7572 | 6e73 | 206f | 7665 | 7220 | 6c65 | 7373 | 2073 | 7061 | 6365 | 2074 | 6861 | 6e20 | 7468 | 6520 | 6d6f | 7265 | 206f | 6276 | 696f | 7573 | 0a25 | 2020 |
| 4122520 | 2073 | 6f6c | 7574 | 696f | 6e20 | 7573 | 696e | 6720 | 756e | 6976 | 2e20 | 2041 | 6e6f | 7468 | 6572 | 2069 | 7320 | 7468 | 6174 | 2069 | 7420 | 646f | 6573 | 2063 |
| 4122600 | 6865 | 636b | 2077 | 6865 | 7468 | 6572 | 2074 | 6865 | 0a25 | 2020 | 2054 | 6572 | 6d20 | 6973 | 2069 | 6e20 | 6661 | 6374 | 2063 | 616c | 6c61 | 626c | 652e | 2020 |
| 4122660 | 4974 | 2069 | 7320 | 6e6f | 7720 | 6361 | 6c6c | 6564 | 2061 | 6674 | 6572 | 2073 | 7472 | 6970 | 5f6d | 6f64 | 756c | 655f | 0a25 | 2020 | 2070 | 7265 | 6669 | 7820 |
| 4122740 | 6861 | 7320 | 7265 | 616f | 7665 | 6420 | 616e | 7920 | 6d6f | 6475 | 6c65 | 3a20 | 7072 | 6566 | 6978 | 2061 | 6e64 | 2063 | 6865 | 636b | 6564 | 2074 | 6861 | 7420 |
| 4123020 | 5465 | 726d | 2069 | 730a | 2520 | 2020 | 6e6f | 7420 | 6120 | 7661 | 7269 | 6162 | 6c65 | 2e20 | 2057 | 6520 | 6172 | 6520 | 6c65 | 6674 | 2074 | 6f20 | 6368 | 6563 |
| 4123100 | 6b20 | 7468 | 6174 | 2054 | 6572 | 6d20 | 6973 | 2063 | 616c | 6c61 | 626c | 652e | 0a0a | 2520 | 2020 | 4566 | 6669 | 6369 | 656e | 6379 | 206e | 6f74 | 652e | 2020 |
| 4123160 | 4c65 | 7474 | 696e | 6720 | 7468 | 6520 | 6172 | 6974 | 7920 | 6f66 | 2054 | 6572 | 6d20 | 6265 | 2041 | 2061 | 6e64 | 2074 | 6865 | 206c | 656e | 6774 | 680a | 2520 |
| 4123240 | 2020 | 6f66 | 204d | 6f72 | 6541 | 7267 | 7320 | 6265 | 204c | 2c20 | 7468 | 6520 | 636f | 7374 | 206f | 6620 | 646f | 696e | 6720 | 6170 | 7065 | 6e64 | 5f74 | 6572 |
| 4123320 | 6d20 | 7468 | 6973 | 2077 | 6179 | 2069 | 730a | 2509 | 302e | 3135 | 202b | 2030 | 2e31 | 3020 | 4120 | 2b20 | 302e | 3036 | 204c | 0928 | 6d69 | 6c6c | 6973 | 6563 |
| 4123400 | 6f6e | 6473 | 206f | 6e20 | 6120 | 5375 | 6e2d | 332f | 3530 | 290a | 2520 | 2020 | 7768 | 6572 | 6561 | 7320 | 7468 | 6520 | 636f | 7374 | 206f | 6620 | 7573 | 696e |
| 4123460 | 6720 | 756e | 6976 | 2028 | 3d2e | 2e29 | 2069 | 730a | 2509 | 302e | 3335 | 202b | 2030 | 2e34 | 3520 | 4120 | 2b20 | 302e | 3135 | 204c | 0928 | 6d69 | 6c6c | 6973 |
| 4123540 | 6563 | 6f6e | 6473 | 206f | 6e20 | 6120 | 5375 | 6e2d | 332f | 3530 | 290a | 2520 | 2020 | 466f | 7220 | 736f | 6d65 | 2074 | 7970 | 6963 | 616c | 2061 | 7267 | 756d |
| 4123620 | 656e | 7473 | 2c20 | 756e | 6976 | 2063 | 616e | 2062 | 6520 | 7468 | 7265 | 6520 | 7469 | 6d65 | 7320 | 6173 | 2065 | 7870 | 656e | 7369 | 7665 | 2e0a | 2520 | 2020 |
| 4123700 | 4865 | 6c70 | 2073 | 7461 | 6d70 | 206f | 7574 | 2075 | 6e69 | 7621 | 2020 | 4966 | 2079 | 6f75 | 2074 | 656c | 6c20 | 7573 | 2074 | 6861 | 7420 | 7468 | 6973 | 206f |
| 4123760 | 7065 | 7261 | 7469 | 6f6e | 2069 | 730a | 2520 | 2020 | 696d | 706f | 7274 | 616e | 7420 | 746f | 2079 | 6f75 | 2c20 | 7765 | 2063 | 6f75 | 6c64 | 206d | 616b | 6520 |
| 4124040 | 6974 | 2071 | 7569 | 7465 | 2061 | 206c | 6f74 | 2066 | 6173 | 7465 | 722e | 0a0a | 6170 | 7065 | 6e64 | 5f74 | 6572 | 6d28 | 5465 | 726d | 2c20 | 4d6f | 7265 | 4172 |
| 4124120 | 6773 | 2c20 | 4675 | 6c6c | 5465 | 726d | 2920 | 3a2d | 0a09 | 6675 | 6e63 | 746f | 7228 | 5465 | 726d | 2c20 | 5379 | 6d62 | 6f6c | 2c20 | 4172 | 6974 | 7929 | 2c0a |
| 4124200 | 0961 | 746f | 6d28 | 5379 | 6d62 | 6f6c | 292c | 0909 | 2520 | 6d75 | 7374 | 2074 | 6573 | 7420 | 6173 | 204d | 6f72 | 6541 | 7267 | 733d | 5b5d | 2069 | 7320 | 6f6b |
| 4124260 | 2e0a | 096c | 656e | 294d | 6f72 | 6541 | 7267 | 732c | 2041 | 7269 | 7479 | 2c20 | 4675 | 6c6c | 4172 | 6974 | 7929 | 2c0a | 0966 | 756e | 6374 | 6f72 | 2846 | 756c |
| 4124340 | 6c54 | 6572 | 6d2c | 2053 | 796d | 626f | 6c2c | 2046 | 756c | 6c41 | 7269 | 7479 | 292c | 0a09 | 6170 | 7065 | 6e64 | 5f74 | 6572 | 6d31 | 284d | 6f72 | 6541 | 7267 |
| 4124420 | 732c | 2041 | 7269 | 7479 | 2c20 | 4675 | 6c6c | 5465 | 726d | 292c | 0a09 | 6170 | 7065 | 6e64 | 5f74 | 6572 | 6d32 | 2841 | 7269 | 7479 | 2c20 | 5465 | 726d | 2c20 |
| 4124500 | 4675 | 6c6c | 5465 | 726d | 292e | 0a0a | 6c65 | 6e28 | 302c | 205f | 2c20 | 5f29 | 203a | 2d20 | 212c | 2066 | 6169 | 6c2e | 0925 | 2063 | 6174 | 6368 | 2070 | 6172 |
| 4124560 | 7469 | 616c | 206c | 6973 | 7473 | 0a6c | 656e | 285b | 5d2c | 204e | 2c20 | 4e29 | 2e0a | 6c65 | 6e28 | 5b5f | 7c4c | 5d2c | 204e | 302c | 204e | 2920 | 3a2d | 0a09 |
| 4124640 | 4e31 | 2069 | 7320 | 4e30 | 2b31 | 2c0a | 096c | 656e | 284c | 2c20 | 4e31 | 2c20 | 4e29 | 2e0a | 0a61 | 7070 | 656e | 645f | 7465 | 726d | 3128 | 5b41 | 312c | 4132 |
| 4124720 | 7c41 | 7267 | 735d | 2c20 | 4d2c | 2046 | 756c | 6c54 | 6572 | 6d29 | 203a | 2d20 | 212c | 0a09 | 4e31 | 2069 | 7320 | 4d2b | 312c | 2061 | 7267 | 284e | 312c | 2046 |
| 4125000 | 756c | 6c54 | 6572 | 6d2c | 2041 | 3129 | 2c0a | 094e | 3220 | 6973 | 204d | 2b32 | 2c20 | 6172 | 6728 | 4e32 | 2c20 | 4675 | 6c6c | 5465 | 726d | 2c20 | 4132 | 292c |
| 4125060 | 0a09 | 6170 | 7065 | 6e64 | 5f74 | 6572 | 6d31 | 2841 | 7267 | 732c | 204e | 322c | 2046 | 756c | 6c54 | 6572 | 6d29 | 2e0a | 6170 | 7065 | 6e64 | 5f74 | 6572 | 6d31 |
| 4125140 | 285b | 4131 | 5d2c | 204d | 2c20 | 4675 | 6c6c | 5465 | 726d | 2920 | 3a2d | 2021 | 2c0a | 094e | 3120 | 6973 | 204d | 2b31 | 2c20 | 6172 | 6728 | 4e31 | 2c20 | 4675 |
| 4125220 | 6c6c | 5465 | 726d | 2c20 | 4131 | 292e | 0a61 | 7070 | 656e | 645f | 7465 | 726d | 3128 | 5b5d | 2c20 | 5f2c | 205f | 292e | 0a0a | 0a25 | 2520 | 2061 | 7070 | 656e |
| 4125300 | 645f | 7465 | 726d | 3228 | 4e2c | 204f | 6c64 | 5465 | 726d | 2c20 | 4e65 | 7754 | 6572 | 6d29 | 0a25 | 2020 | 2069 | 7320 | 7472 | 7565 | 2077 | 6865 | 6e20 | 7468 |
| 4125360 | 6520 | 4974 | 6820 | 6172 | 6775 | 6d65 | 6e74 | 206f | 6620 | 4f6c | 6454 | 6572 | 6d20 | 756e | 6966 | 6965 | 7320 | 7769 | 7468 | 2074 | 6865 | 0a25 | 2020 | 2049 |
| 4125440 | 7468 | 2061 | 7267 | 756d | 656e | 7420 | 6f66 | 204e | 6577 | 5465 | 726d | 2c20 | 666f | 7220 | 3120 | 3c3d | 2049 | 203c | 3d20 | 4e2e | 2020 | 4974 | 2068 | 6173 |

```
4125520 2062 6565 6e0a 2520 2020 6861 636b 6564 2066 6f72 2073 7065 6564 2072 6174 6865 7220 7468 616e 2063 6c61 7269 7479 2e0a
4125600 0a61 7070 656e 645f 7465 726d 3228 4e2c 204f 6c64 5465 726d 2c20 4e65 7754 6572 6d29 203a 2d0a 0928 2020 204e 203e 2031
4125660 202d 3e0a 0920 2020 2061 7267 284e 2c20 4f6c 6454 6572 6d2c 2041 7267 4e29 2c0a 0920 2020 2061 7267 284e 2c20 4e65 7754
4125740 6572 6d2c 2041 7267 4e29 2c0a 0920 2020 204d 2069 7320 4e2d 312c 0a09 2020 2020 6172 6728 4d2c 204f 6c64 5465 726d 2c20
4126020 4172 674d 292c 0a09 2020 2020 6172 6728 4d2c 204e 6577 5465 726d 2c20 4172 674d 292c 0a09 2020 2020 4c20 6973 2043 2d31
4126100 2c0a 0920 2020 2061 7070 656e 645f 7465 726d 3228 4c2c 204f 6c64 5465 726d 2c20 4e65 7754 6572 6d29 0a09 3b20 2020 4e20
4126160 3e20 3020 2d3e 0a09 2020 2020 6172 6728 312c 204f 6c64 5465 726d 2c20 4172 6731 292c 0a09 2020 2020 6172 6728 312c 204e
4126240 6577 5465 726d 2c20 4172 6731 290a 093b 2020 2074 7275 650a 0929 2e0a 0a0a 2525 2020 6170 7065 6e64 5f74 6572 6d28 2b54
4126320 6572 6d2c 202b 4e65 7874 7261 2c20 2d41 7269 7479 2c20 2d46 756c 6c54 6572 6d29 0a25 2020 2069 7320 6769 7665 6e20 6120
4126400 5465 726d 2061 6e64 2074 6865 206e 756d 6265 7220 6f66 2065 7874 7261 2061 7267 756d 656e 7473 2028 3e3d 3129 2074 6f20
4126460 6265 0a25 2020 2061 6464 6564 2e20 2049 7420 7265 7475 726e 7320 7468 6520 4172 6974 7920 6f66 2054 6572 6d2c 2061 6e64
4126540 2061 206e 6577 2046 756c 6c54 6572 6d20 7768 6963 680a 2520 2020 6861 7320 7468 6520 7361 6165 2066 756e 6374 696f 6e20
4126620 5379 6d62 6f6c 2061 6e64 2066 6972 7374 2041 7269 7479 2061 7267 756d 656e 7473 2061 7320 5465 726d 0a25 2020 2061 6e64
4126700 2077 686f 7365 206c 6173 7420 4e65 7874 7261 2061 7267 756d 656e 7473 2061 7265 2075 6e69 6e73 7461 6e74 6961 7465 642e
4126760 2020 4e6f 7465 2074 6861 740a 2520 2020 7765 2064 6f20 6e6f 7420 6e65 6564 2074 6f20 6578 706c 6963 6974 6c79 2074 6573
4127040 7420 666f 7220 6174 6f6d 2853 796d 626f 6c29 2c20 6173 2074 6865 0a25 2020 2066 756e 6374 6f72 2846 756c 6c54 6572 6d2c
4127120 2053 796d 626f 6c2c 2046 756c 6c41 7269 7479 202f 2a20 3e20 3020 2a2f 2920 636f 6e73 7472 7563 7469 6f6e 0a25 2020 2077
4127200 696c 6c20 696d 706c 6963 6974 6c79 206d 616b 6520 7468 6973 2074 6573 742e 0a0a 6170 7065 6e64 5f74 6572 6d28 5465 726d
4127260 2c20 4e65 7874 7261 2c20 4172 6974 792c 2046 756c 6c54 6572 6d29 203a 2d0a 0966 756e 6374 6f72 2854 6572 6d2c 2053 796d
4127340 626f 6c2c 2041 7269 7479 292c 0909 2520 7765 206b 6e6f 7720 6e6f 6e76 6172 2854 6572 6d29 0a09 4675 6c6c 4172 6974 7920
4127420 6973 2041 7269 7479 2b4e 6578 7472 612c 0909 2520 4675 6c6c 4172 6974 7920 3e20 300a 0966 756e 6374 6f72 2846 756c 6c54
4127500 6572 6d2c 2053 796d 626f 6c2c 2046 756c 6c41 7269 7479 292c 0925 2074 6573 7473 2061 746f 6d28 5379 6d62 6f6c 290a 0961
4127560 7070 656e 645f 7465 726d 3228 4172 6974 792c 2054 6572 6d2c 2046 756c 6c54 6572 6d29 2e0a 0a0a 2f2a 2020 5468 6520 6361
4127640 6c6c 2f4e 2066 616d 696c 7920 6861 7665 2074 6865 2066 6f72 6d0a 0963 616c 6c28 5072 6564 2c20 5931 2c20 2e2e 2e2c 2059
4127720 6e29 2e0a 2020 2020 5468 6579 2068 6176 6520 6578 6163 746c 7920 7468 6520 7361 6d65 2065 6666 6563 7420 6173 0a09 6170
4130000 706c 7928 5072 6564 2c20 5b59 312c 2e2e 2e2c 596e 5d29 0a20 2020 2065 7863 6570 7420 7468 6174 2074 6865 7920 646f 6e27
4130060 7420 7265 7175 6972 6520 7468 6520 636f 6e73 7472 7563 7469 6f6e 206f 6620 6120 6c69 7374 2c0a 2020 2020 616e 6420 7468
4130140 6579 2063 616e 2062 6520 7479 7065 2d63 6865 636b 6564 2c20 7768 6963 6820 6170 706c 792f 3220 6361 6e6e 6f74 2062 652e
4130220 0a20 2020 2054 6865 2069 6465 6120 6973 2074 6861 740a 0963 616c 6c28 4d6f 6475 6c65 3a70 7265 6428 5831 2c2e 2e2e 2c58
4130300 6d29 2c20 5931 2c2e 2e2e 2c59 6e29 0a20 2020 2069 7320 6571 7569 7661 6c65 6e74 2074 6f0a 094d 6f64 756c 653a 7072 6564
4130360 2858 312c 202e 2e2e 2c20 586d 2c20 5931 2c20 2e2e 2e2c 2059 6e29 0a0a 2020 2020 4964 6561 6c6c 792c 2063 616c 6c2f 4e20
4130440 7368 6f75 6c64 2062 6520 6465 6669 6e65 6420 666f 7220 616c 6c20 7661 6c75 6573 206f 6620 4e2e 0a20 2020 2041 7420 7468
4130520 6520 6d6f 6d65 6e74 2c20 6974 2069 7320 6f6e 6c79 2064 6566 696e 6564 2066 6f72 2075 7020 746f 204e 3d36 2065 7874 7261
4130600 2061 7267 756d 656e 7473 2e0a 2a2f 0a0a 2520 2020 6361 6c6c 282b 7072 6564 2858 312c 2e2e 2e2c 586d 292c 203f 5931 290a
4130660 2520 2020 6361 6c6c 7320 7072 6564 2858 312c 202e 2e2e 2c20 586d 2c20 5931 2929 0a0a 6361 6c6c 2854 6572 6d2c 2059 3129
4130740 203a 2d0a 0973 7472 6970 5f6d 6f64 756c 655f 7072 6566 6978 2854 6572 6d2c 2075 7365 722c 2046 6f72 6d2c 204d 6f64 756c
4131020 6529 2c0a 0961 7070 656e 645f 7465 726d 2846 6f72 6d2c 2031 2c20 4e2c 2046 756c 6c29 2c0a 0921 2c0a 094e 3120 6973 204e
4131100 2b31 2c20 6172 6728 4e31 2c20 4675 6c6c 2c20 5931 292c 0a09 4d6f 6475 6c65 3a46 756c 6c2e 0a63 616c 6c28 5465 726d 2c20
4131160 5931 2920 3a2d 0a09 666f 726d 6174 2875 7365 725f 6572 726f 722c 0a09 2020 2020 277e 4e21 2031 7374 2061 7267 756d 656e
4131240 7420 6f66 2063 616c 6c2f 7e71 2069 7320 6e6f 7420 6361 6c6c 6162 6c65 7e6e 2120 476f 616c 3a20 7e71 7e6e 272c 0a09 2020
4131320 2020 5b32 2c20 6361 6c6c 2854 6572 6d2c 5931 295d 292c 0a09 6661 696c 2e0a 0a0a 2520 2020 6361 6c6c 282b 7072 6564 2858
4131400 312c 2e2e 2e2c 586d 292c 203f 5931 2c20 3f59 3229 0a25 2020 2063 616c 6c73 2070 7265 6428 5831 2c20 2e2e 2e2c 2058 6d2c
4131460 2059 312c 2059 3229 290a 0a63 616c 6c28 5465 726d 2c20 5931 2c20 5932 2920 3a2d 0a09 7374 7269 705f 6d6f 6475 6c65 5f70
4131540 7265 6669 7828 5465 726d 2c20 7573 6572 2c20 466f 726d 2c20 4d6f 6475 6c65 292c 0a09 6170 7065 6e64 5f74 6572 6d28 466f
4131620 726d 2c20 322c 204e 2c20 4675 6c6c 292c 0a09 212c 0a09 4e31 2069 7320 4e2b 312c 2061 7267 284e 312c 2046 756c 6c2c 2059
4131700 3129 2c0a 094e 3220 6973 204e 2b32 2c20 6172 6728 4e32 2c20 4675 6c6c 2c20 5932 292c 0a09 4d6f 6475 6c65 3a46 756c 6c2e
4131760 0a63 616c 6c28 5465 726d 2c20 5931 2c20 5932 2920 3a2d 0a09 666f 726d 6174 2875 7365 725f 6572 726f 722c 0a09 2020 2020
4132040 277e 4e21 2031 7374 2061 7267 756d 656e 7420 6f66 2063 616c 6c2f 7e71 2069 7320 6e6f 7420 6361 6c6c 6162 6c65 7e6e 2120
4132120 476f 616c 3a20 7e71 7e6e 272c 0a09 2020 2020 5b33 2c20 6361 6c6c 2854 6572 6d2c 5931 2c59 3229 5d29 2c0a 0966 6169 6c2e
4132200 0a0a 0a25 2020 2063 616c 6c28 2b70 7265 6428 5831 2c2e 2e2e 2c58 6d29 2c20 3f59 312c 203f 5932 2c20 3f59 3329 0a25 2020
4132260 2063 616c 6c73 2070 7265 6428 5831 2c20 2e2e 2e2c 2058 6d2c 2059 312c 2059 322c 2059 3329 290a 0a63 616c 6c28 5465 726d
4132340 2c20 5931 2c20 5932 2c20 5933 2920 3a2d 0a09 7374 7269 705f 6d6f 6475 6c65 5f70 7265 6669 7828 5465 726d 2c20 7573 6572
4132420 2c20 466f 726d 2c20 4d6f 6475 6c65 292c 0a09 6170 7065 6e64 5f74 6572 6d28 466f 726d 2c20 332c 204e 2c20 4675 6c6c 292c
4132500 0a09 212c 0a09 4e31 2069 7320 4e2b 312c 2061 7267 284e 312c 2046 756c 6c2c 2059 3129 2c0a 094e 3220 6973 204e 2b32 2c20
4132560 6172 6728 4e32 2c20 4675 6c6c 2c20 5932 292c 0a09 4e33 2069 7320 4e2b 332c 2061 7267 284e 332c 2046 756c 6c2c 2059 3329
```

```
4132640  2c0a 094d 6f64 756c 653a 4675 6c6c 2e0a 6361 6c6c 2854 6572 6d2c 2059 312c 2059 322c 2059 3329 203a 2d0a 0966 6f72 6d61
4132720  7428 7573 6572 5f65 7272 6f72 2c0a 0920 2020 2027 7e4e 2120 3173 7420 6172 6775 6d65 6e74 296f 6620 6361 6c6c 2f7e 7120
4133000  6973 206e 6f74 2063 616c 6c61 626c 657e 6e21 2047 6f61 6c3a 207e 717e 6e27 2c0a 0920 2020 205b 342c 2063 616c 6c28 5465
4133060  726d 2c59 312c 5932 2c59 3329 5d29 2c0a 0966 6169 6c2e 0a0a 0a25 2020 2063 616c 6c28 2b70 7265 6428 5831 2c2e 2c2e 2c58
4133140  6d29 2c20 3f59 312c 203f 5932 2c20 3f59 332c 203f 5934 290a 2520 2020 6361 6c6c 7320 7072 6564 2858 312c 202e 2e2e 2c20
4133220  586d 2c20 5931 2c20 5932 2c20 5933 2c20 5934 2929 0a0a 6361 6c6c 2854 6572 6d2c 2059 312c 2059 322c 2059 332c 2059 3429
4133300  203a 2d0a 0973 7472 6970 5f6d 6f64 756c 655f 7072 6566 6978 2854 6572 6d2c 2075 7365 722c 2046 6f72 6d2c 204d 6f64 756c
4133360  6529 2c0a 0961 7070 656e 645f b464 0028 0018 22cc 0000 0000 001e 2240 2823 2938 392f 3036 2f30 3120 6f72 6465 7265 642e
4133440  706c 0933 322e 3122 0000 0000 0018 161c 0100 2def 0C00 7f77 0000 0004 0018 a034 0018 a034 0001 0085 0000 0000 000a 666c
4133520  6f77 5f67 7261 7068 0000 0000 0000 0028 0017 ee1c b27c b66c 0000 1152 7fff ffff 0019 9338 0200 0db5 0100 32b5 0000 7f77
4133600  0000 315f 0000 7f77 b328 0000 0018 9ff8 0000 0000 000e 805c 0000 0000 0018 a014 0018 a024 2cac 0000 0002 438a 2ca0 0000
4133660  0000 0000 0000 0001 0017 f5e9 0017 f5e8 0002 438a 0018 1788 0000 0000 0019 24ed 0018 e6e8 0018 e3e4 0018 7730 0018 7708
4133740  2cac 0000 0002 438a 2ca0 0000 0000 0000 0000 0001 0017 8048 0016 4e14 0016 4e1e 0018 17c8 0014 807c 0200 7fb7 0000 7f77
4134020  0000 0008 0018 a0dc 0018 a0dc 0001 0085 0000 0000 000a 6667 5f70 6963 7475 7265 0000 0000 0000 85b7 b328 0000 0018 c15c
4134100  0000 0000 0005 6e6f 6465 3100 2cac 0000 0002 438a 2ca0 0000 0000 0000 0000 0001 0018 1740 0018 a104 0018 a10e 0018 a100
4134160  0018 174c 2954 0020 0002 438a 56f8 6840 69b0 3574 37f0 8d94 aab4 0000 a538 2330 0018 a0a4 0009 6861 6c31 2e76 6864 6c00
4134240  0014 800c 0200 7faf 0000 7f77 0000 0008 0018 a184 0018 a184 0001 0085 0000 0000 2c78 0010 0002 438a 239c 0000 0019 220c
4134320  0018 e7a0 0018 e770 0018 e8cc 0000 0000 27f0 0012 0018 a1ac 4e1c 0000 0000 0007 228c 0000 2cac 0000 0002 438a 2ca0 0000
4134400  0000 0000 0000 0001 0018 a170 0018 a1ac 0018 a1b6 0018 a1a8 0018 a17c 2954 0018 0002 438a 56f8 6420 3640 3600 239c 0000
4134460  0018 a1d4 0018 a094 0300 7fb7 0000 7f77 0000 000c 0018 a204 0018 a204 0001 0085 0000 0000 0007 7465 7374 7275 6e00 acc0
4134540  27f0 0012 0018 a22c 4e1c 0000 0000 0007 228c 0000 2cac 0000 0002 438a 2ca0 0000 0000 0000 0000 0001 0018 a1f0 0018 a22c
4134620  0018 a236 0018 a228 0018 a1fc 2954 0020 0002 438a 56f8 6840 69b0 4768 3858 3a4c 0008 b6dc 0018 231c 0018 a1d4 0200 3d5f
4134700  29c8 a0c4 0018 aa0c 0018 5fec 0014 83e4 0300 7fe7 0000 7f77 0000 000c 0018 a620 0018 a620 0001 0085 0000 0000 2c78 0018
4134760  0002 438a 362c 5758 622c 359c 239c 0000 0018 a2a4 0014 809c 0300 7fbf 0000 7f77 0000 000c 0018 a2c8 0018 a2c8 0001 0085
4135040  0000 0000 27f0 0014 0018 a2f0 4e1c 0000 0000 0007 4960 228c 2cac 0000 0002 438a 2ca0 0000 0000 0000 0000 0001 0018 a2b4
4135120  0018 a314 0018 a334 0018 a2ec 0018 a2c0 28c4 0024 0018 a314 56f8 671c 682c 46ec 4768 37f0 8d94 aab4 0000 a538 2ecc 231c
4135200  0018 a2a4 2954 0014 0002 438a 56f8 6420 3600 22bc 0018 a2a4 2b24 0000 0002 438a 0018 a31e 29c8 0000 0018 a328 0018 a2fa
4135260  000d 6469 7370 6c61 795f 6e6f 6465 7300 2c78 0018 0002 438a 362c 5758 622c 359c 239c 0000 0018 a378 0014 80bc 0300 7fc7
4135340  0000 7f77 0000 000c 0018 a3ac 0018 a3ac 0001 0085 0000 0000 2954 0010 0002 438a 239c 0000 000c 18bc 27f0 0014 0018 a3d4
4135420  4e1c 0000 0000 0007 4960 228c 2cac 0000 0002 438a 2ca0 0000 0000 0000 0000 0001 0018 a398 0018 a3fc 0018 a41c 0018 a3d0
4135500  0018 a3a4 28c4 0028 0018 a3fc 56f8 671c 682c 46ec 4768 35c8 3788 8494 aab4 0000 a538 2ecc 23fc 0000 0018 a378 2954 0014
4135560  0002 438a 56f8 6420 3600 22bc 0018 a378 2b24 0000 0002 438a 0018 a406 29c8 0000 0018 a410 0018 a3de 0009 5648 444c 2046
4135640  696c 6500 2c78 0024 0002 438a 3690 57b8 66c0 001c 0018 3640 3614 001c 35b0 0018 239c 0000 0018 a468 0018 a294 0400 7fbf
4135720  0000 7f77 0000 0010 0018 a498 0018 a498 0001 0085 0000 0000 b464 0000 000b 37cc 001a 4190 27f0 0014 0018 272c 4e1c 0000
4136000  0000 0007 4960 228c 2cac 0000 0002 438a 2ca0 0000 0000 0000 0000 0001 0018 a484 0018 a4c0 0018 a4e4 0018 a4bc 0018 a490
4136060  2954 0018 0002 438a 56f8 6580 0018 3614 0018 22bc 0018 a468 2b24 0000 0002 438a 0018 a4ca 29c8 0000 0018 a4d8 0018 2736
4136140  0006 7374 6174 7573 0019 2614 2c78 0024 0002 438a 3690 57b8 66c0 001c 0018 3640 3614 001c 35b0 0018 239c 0000 0018 a530
4136220  0018 a368 0400 7fc7 0000 7f77 0000 0010 0018 a560 0018 a560 0001 0085 0000 0000 0007 696e 7370 6563 7400 0000 27f0 0014
4136300  0018 27c8 4e1c 0000 0000 0007 4960 228c 2cac 0000 0002 438a 2ca0 0000 0000 0000 0000 0001 0018 a54c 0018 a588 0018 a5ac
4136360  0018 a584 0018 a558 2954 0018 0002 438a 56f8 6580 0018 3614 0018 22bc 0018 a530 2b24 0000 0002 438a 0018 a592 29c8 0000
4136440  0018 a5a0 0018 27d2 000b 7365 6c5f 6d69 6e5f 7472 6d00 0000 000d 6170 7065 6e64 5f73 7566 6669 7800 2c78 0018 0002 438a
4136520  36a4 35ec 362c 359c 239c 0000 0018 a26c 000c 6275 696c 645f 636f 6c6f 7273 0000 0018 a25c 0500 7fe7 0000 7f77 0000 0014
4136600  0018 a694 0018 a6bc 0001 0085 0000 0000 2cac 0000 0002 438a 2ca0 0000 0000 0000 0000 0000 0018 28a4 0018 a648 0018 a668
4136660  0018 a644 0000 0000 2954 0012 0002 438a 56f8 60cc 4928 4950 228c 0000 2b24 0000 0002 438a 0018 a652 29c8 0000 0018 a65c
4136740  0018 28ae 2954 000a 0002 438a 228c 0000 2938 0014 0018 291c 4e1c 0000 0000 0007 3050 c5a8 27f0 0000 0018 a6bc 2ca0 0000
4137020  0000 0000 0000 0001 0018 a680 0018 a6bc 0018 2926 0018 a6b8 0018 a68c 2954 0010 0002 438a 49a8 4a18 0018 228c 0007 7069
4137100  6374 7572 6500 a120 2c78 0024 0002 438a 3724 0018 373c 001c 36a4 362c 3614 001c 35b0 0018 239c 0000 0018 a70c 0014 82b4
4137160  0400 7fcf 0000 7f77 0000 0010 0018 a74c 0018 a74c 0001 0085 0000 0000 000c 6469 7370 6c61 795f 6e6f 6465 0000 0018 a6fc
4137240  0600 7fcf 0000 7f77 0000 0018 0018 a7c4 0018 a7ec 0001 0085 0000 0000 2cac 0000 0002 438a 2ca0 0000 0000 0000 0000 0000
4137320  0018 29c4 0018 a774 0018 a798 0018 a770 0000 0000 2954 0016 0002 438a 56f8 6110 0018 4938 0018 49a8 228c 0000 2b24 0000
4137400  0002 439a 0018 a77e 29c8 0000 0018 a78c 0018 29ce 0009 636f 6e6e 6563 7465 6400 2938 0014 0018 2a44 4e1c 0000 0000 0007
4137460  3050 c5a8 27f0 0000 0018 a7ec 2ca0 0000 0000 0000 0000 0001 0018 a7b0 0018 a7ec 0018 2a4e 0018 a7e8 0018 a7bc 2954 0012
4137540  0002 438a 4a00 0018 4a18 001c 228c 0000 000b 7365 6c5f 6d61 785f 7472 6d00 0000 000a 6469 7370 6c61 795f 6667 0000 0000
4137620  2c78 0018 0002 438a 36a4 35ec 362c 359c 239c 0000 0018 a848 0014 8404 0300 7fef 0000 7f77 0000 000c 0018 a888 0018 a888
4137700  0001 0085 0000 0000 000d 6469 7370 6c61 795f 6772 6170 6800 0018 a838 0500 7fef 0000 7f77 0000 0014 0018 a8fc 0018 a924
```

```
4137760  0001 0085 0000 0000 2cac 0000 0002 438a 2ca0 0000 0000 0000 0000 0000 0018 2afc 0018 a8b0 0018 a8d0 0018 a8ac 0000 0000
4140040  2954 0012 0002 438a 56f8 60cc 4928 4950 228c 0000 2b24 0000 0002 438a 0018 a8ba 29c8 0000 0018 a8c4 0018 2b06 0006 6865
4140120  6154 6572 0018 b14c 2938 0014 0018 2b74 4e1c 0000 0000 0007 3050 c5a8 27f0 0000 0018 a924 2ca0 0000 0000 0000 0000 0001
4140200  0018 a8e8 0018 a924 0018 2b7e 0018 a920 0018 a8f4 2954 0010 0002 438a 49a8 4a18 0018 228c 0006 7265 7375 6465 0018 a124
4140260  2c78 0024 0002 438a 3724 0018 373c 001c 36a4 362c 3614 001c 35b0 0018 239c 0000 0018 a974 0014 82d4 0400 7fd7 0000 7f77
4140340  0000 0010 0018 a9b4 0018 a9b4 0001 0085 0000 0000 000a 6f72 6465 7265 642e 706c 0000 0000 0018 a964 0600 7fd7 0000 7f77
4140420  0000 0018 0018 aa2c 0018 aa54 0001 0085 0000 0000 2cac 0000 0002 438a 2ca0 0000 0000 0000 0000 0000 0018 2c1c 0018 a9dc
4140500  0018 aa00 0018 a9d8 0000 0000 2954 0016 0002 438a 56f8 6110 0018 4938 0018 49a8 228c 0000 2b24 0000 0002 438a 0018 a9e6
4140560  29c8 0000 0018 a9f4 0018 2c26 2b24 adc0 0002 438a 0018 6020 2938 0014 0018 2c9c 4e1c 0000 0000 0007 3050 c5a8 27f0 0000
4140640  0018 aa54 2ca0 0000 0000 0000 0000 0001 0018 aa18 0018 aa54 0018 2ca6 0018 aa50 0018 aa24 2954 0012 0002 438a 4a00 0018
4140720  4a18 001c 228c 0000 b464 f474 0011 7740 0018 a308 0011 6469 7370 6c61 795f 6e6f 6465 735f 6175 7800 0008 6573 7469 6d61
4141000  7465 0098 27f0 0012 0018 60b4 4e1c 0000 0000 0007 228c aa74 0018 e380 0018 e350 0004 7461 696c 0000 0005 6772 6565 6e00
4141060  000e 86a4 0000 0000 0018 39e4 0018 aac0 0018 7c94 0100 7f77 0000 3287 0000 0004 0018 3a24 0018 3a24 0041 0000 0000 0000
4141140  0018 aad0 0200 7f77 0000 3287 0000 0008 0018 ab10 0018 ab10 0041 0000 0000 0000 2c78 0020 0002 438a 362c 43c0 0200 0daf
4141220  4b8c 0000 0000 3287 6bc8 22bc 0018 7ca4 0018 7d14 0200 7f9f 0000 3287 0000 0008 0018 ab50 0018 ab50 0041 0000 0000 0000
4141300  2c78 0010 0002 438a 239c 0000 0018 7cc4 2c78 0010 0002 438a 239c 0000 0018 7cf4 0018 ab30 0300 7f9f 0000 3287 0000 000c
4141360  0018 ab90 0018 ab90 0041 0000 0000 0000 2c78 0020 0002 438a 3690 43c0 0200 0daf 4b8c 0000 0000 3287 6c08 22bc 0018 7d24
4141440  0018 7d34 0300 6cd7 0000 3287 0000 000c 0018 abd0 0018 abd0 0041 0000 0000 0000 2c78 0020 0002 438a 3690 43c0 0200 0daf
4141520  4b8c 0000 0000 3287 6c08 22bc 0018 7d44 2c78 0010 0002 438a 239c 0000 0018 7d64 0018 7d84 0400 778f 0000 3287 0000 0010
4141600  0018 ac20 0018 ac20 0041 0000 0000 0000 2c78 0028 0002 438a 36f4 0018 447c 0000 0200 0daf 4b8c 0000 0000 3287 6c48 0018
4141660  239c 0000 0018 7d94 0018 7de0 0300 7fa7 0000 3287 0000 000c 0018 ac68 0018 ac68 0041 0000 0000 0000 2c78 0010 0002 438a
4141740  239c 0000 0018 7dc0 0018 ac48 0400 7fa7 0000 3287 0000 0010 0018 ac98 0018 ac98 0041 0000 0000 0000 2c78 0028 0002 438a
4142020  36f4 0018 447c 0000 0200 0daf 4b8c 0000 0000 3287 6c48 0018 239c 0000 0018 7df0 0007 746f 705f 7069 6300 a8dc 0008 7668
4142100  646c 5f74 6162 0040 0007 7e6e 7e6e 7e70 3a00 0000 b464 a47c 000a 2cf0 0018 a478 29c8 be4c 0017 f470 0019 9df6 0007 6578
4142160  6563 7574 6500 f464 b464 a4f4 0018 79f8 0019 30a4 2954 000a 0002 438a 228c ad20 0007 7e70 3b7e 6e7e 7000 bd28 0007 6f75
4142240  7470 7574 7300 ad38 0006 696e 7075 7473 0019 ad44 0006 6f70 636f 6465 0018 ad50 2954 000a 0002 438a 228c ad5c 0007 636f
4142320  6e6e 6563 7400 0000 0006 6578 706f 7365 0000 0000 0009 7075 7464 625f 6466 6700 0008 696e 6974 5f64 6667 008c 0009 6765
4142400  7464 625f 6466 6700 0007 6b6c 7573 7465 7200 a1e4 0008 636f 6e6e 6563 7431 00b0 0006 6369 7263 6c65 0018 adbc 0009 7668
4142460  646c 5f66 696c 6500 0006 6361 6e76 6173 0018 add4 0008 6d61 785f 636f 6c73 0000 0014 85f4 0400 7fff 0000 3287 0000 0010
4142540  0018 5d28 0018 5d28 0001 0084 0000 0000 0005 7374 796c 6500 0011 772c 0014 86b4 0300 8007 0000 3287 0000 000c 0018 ae4c
4142620  0018 ae4c 0001 0084 0000 0000 0014 867c 0300 800f 0000 3287 0000 000c 0018 aeb0 0018 aeb0 0001 0084 0000 0000 2cac 0000
4142700  0002 438a 2ca0 0000 0000 0000 0000 0001 0011 7720 0018 ae70 0018 ae7a 0018 ae08 2954 0028 0002 438a 56f8 6420 57b8 6620
4142760  0018 5ec0 0000 0018 0200 0ad7 6c34 6b88 239c 0000 0018 ae1c 0014 6469 7370 6c61 795f 636f 6e6e 6563 7469 7669 7479 0000
4143040  2c78 001c 0002 438a 2520 46d8 35ec 247c 0018 aedc 0010 2340 0018 aefc 0014 87dc 0200 801f 0000 3287 0000 0008 0018 5e48
4143120  0018 5e48 0001 0084 0000 0000 0014 88e4 0100 8027 0000 3287 0000 0004 0018 b1c4 0018 b1c4 0001 0084 0000 0000 0017 7069
4143200  6374 7572 655f 616e 645f 6361 6e76 6173 5f73 697a 6500 0000 0014 898c 0200 802f 0000 3287 0000 0008 0018 b268 0018 b268
4143260  0001 0084 0000 0000 0015 344c 0200 8037 0000 3287 0000 0008 0018 afa8 0018 afa8 0001 0084 0000 0000 0013 7a70 0400 804f
4143340  0000 3287 0000 0010 0018 afd0 0018 afd0 0001 0084 0000 0000 0018 aeec 0200 8027 0000 3287 0000 0008 0018 6774 0018 682c
4143420  0001 0084 0000 0000 2cac 0000 0002 438a 2ca0 0000 0000 0000 0000 0001 0018 5fdc 0018 6010 0002 438a 0018 afcc 0018 a24c
4143500  2c78 0024 0002 438a 373c 0018 a890 aab4 0002 9eb8 ad18 001c 36dc 001c 239c 0000 0018 b004 0018 af68 0500 804f 0000 3287
4143560  0000 0014 0018 b014 0018 b014 0001 0084 0000 0000 2cac 0000 0002 438a 2ca0 0000 0000 0000 0000 0001 0018 aa94 0018 60b4
4143640  0018 60be 0018 b038 0018 aaa0 000b 6469 7370 6c61 795f 726f 7700 0000 0012 04b8 0500 8057 0000 3287 0000 0014 0018 b090
4143720  0018 b090 0001 0084 0000 0000 0300 57af 29c8 0000 0018 bd4c 0019 56bc 27f0 0012 0018 6158 4e1c 0000 0000 0007 228c 0000
4144000  2cac 0000 0002 438a 2ca0 0000 0000 0000 0000 0001 0018 b07c 0018 6158 0018 6162 0018 b0b4 0018 b088 0014 86ec 0300 8017
4144060  0000 3287 0000 000c 0018 61d4 0018 644c 0001 0084 0000 0000 0000 0000 0019 245d 0018 f274 0018 f0b0 0012 04d8 0500 805f
4144140  0000 3287 0000 0014 0018 4398 0018 4398 0001 0087 0000 0000 28c4 0000 0018 6294 2ca0 0000 0000 0000 0000 0001 0018 6228
4144220  0018 6294 0002 438a 0018 b12c 0018 6234 28c4 0000 0018 6354 2ca0 0000 0000 0000 0000 0001 0018 62e8 0018 6354 0002 438a
4144300  0018 b154 0018 62f4 0017 a09c 0200 3a5f 0000 3287 0000 0008 0018 bc08 0018 bc08 0041 0000 0000 0000 28c4 0000 0018 644c
4144360  2ca0 0000 0000 0000 0000 0001 0018 6400 0018 644c 0002 438a 0018 b19c 0018 640c 0000 0000 0019 23d5 0018 ea50 0018 e80c
4144440  27f0 0012 0018 b1ec 4e1c 0000 0000 0007 228c 0000 2cac 0000 0002 438a 2ca0 0000 0000 0000 0000 0001 0018 b1b0 0018 b1ec
4144520  0018 b1f6 0018 b1e8 0018 b1bc 2954 0028 0002 438a 56f8 671c 682c 5aec 0200 0ad7 6044 247c 0018 af98 0010 2ecc 2420 0000
4144600  0018 aefc 0014 8aa4 0200 806f 0000 3287 0000 0008 0018 46e8 0018 46e8 0001 0087 0000 0000 28c4 0024 0018 682c 45b8 46ec
4144660  3b4c 0000 0012 4e9c 0014 39f8 0012 4e9c 0014 2330 0018 b224 000c 6765 745f 6c69 6e65 5f72 6566 0000 2c78 0018 0002 438a
4144740  3640 41e8 0000 0003 239c 0000 0018 b290 0018 af28 0300 802f 0000 3287 0000 000c 0018 b2b4 0018 b2b4 0001 0084 0000 0000
4145020  27f0 0014 0018 6b24 4e1c 0000 0000 0007 4960 228c 2cac 0000 0002 438a 2ca0 0000 0000 0000 0000 0001 0018 b2a0 0018 6b24
```

```
4145100  0018 6b2e 0018 b2d8 0018 b2ac 000b 6275 696c 645f 6772 6170 6800 0000 0014 8ae0 0200 8077 0000 3287 0000 0008 0018 b31c
4145160  0018 b31c 0001 0084 0000 0000 000c 636f 6d70 696c 655f 7668 646c 0000 2c78 0014 0002 438a 3640 4368 239c 0000 0018 b340
4145240  0018 b2ec 0300 8077 0000 3287 0000 000c 0018 b364 0018 b364 0001 0084 0000 0000 27f0 0014 0018 6bdc 4e1c 0000 0000 0007
4145320  4960 2edc 2cac 0000 0002 438a 2ca0 0000 0000 0000 0000 0001 0018 b350 0018 6bdc 0018 6be6 0018 b388 0018 b35c 000c 6275
4145400  696c 645f 6772 6170 6831 0000 0012 0538 0300 807f 0000 3287 0000 000c 0018 b3e0 0018 b3e0 0001 0084 0000 0000 0010 6275
4145460  696c 645f 6772 6170 6831 5f61 7578 0000 0000 85b7 b328 0000 0018 c104 0000 0000 2c78 0014 0002 438a 36b8 437c 239c 0000
4145540  0018 b404 0012 0558 0400 8087 0000 3287 0000 0010 0018 b438 0018 b438 0001 0084 0000 0000 000d 636c 7573 7465 7273 2e68
4145620  656c 7000 27f0 0014 0018 6ca0 4e1c 0000 0000 0007 49c8 228c 2cac 0000 0002 438a 2ca0 0000 0000 0000 0000 0001 0018 b424
4145700  0018 6ca0 0018 6caa 0018 b45c 0018 b430 0011 6275 696c 645f 6772 6170 6831 5f61 7578 3100 0012 05f8 0300 808f 0000 3287
4145760  0000 000c 0018 b4b4 0018 b4f4 0001 0084 0000 0000 0000 0000 0018 b529 0018 ee2c 0018 ec08 0002 636d 0000 0000 0018 e4a4
4146040  0000 0000 27f0 000e 0018 6d1c 54a8 54f8 2edc 0000 000c 6973 5f63 6f6e 6e65 6374 6564 0000 0012 0618 0200 8097 0000 3287
4146120  0000 0008 0018 6188 0018 6dfc 0001 0084 0000 0000 2954 0014 0002 438a 5758 5fa0 6750 22bc 0018 b484 000b 6973 5f69 6e70
4146200  7574 5f6f 6600 0000 000a 7061 7274 6974 696f 6e73 0000 0000 0019 2b80 0018 b530 0018 ecc8 0000 0000 0012 0638 0200 809f
4146260  0000 3287 0000 0008 0018 b5dc 0018 b5dc 0001 0084 0000 0000 000c 6973 5f6f 7574 7075 745f 6f66 0000 000f 6973 5f6f 7574
4146340  7075 745f 6964 5f6f 6600 0000 0012 0658 0200 80a7 0000 3287 0000 0008 0018 b610 0018 b610 0001 0084 0000 0000 0016 44c0
4146420  0200 80af 0000 3287 0000 0008 0018 6f90 0018 6f90 0001 0084 0000 0000 000d 6465 6c5f 6578 7061 6e73 696f 6e00 0018 df24
4146500  0000 0000 0004 6e6f 6465 0000 2c78 0024 0002 438a 2520 46ec 35c8 3280 24d0 0000 0012 0508 0014 37f0 3cf4 234c 000b 7b30
4146560  000d 6164 645f 6578 7061 6e73 696f 6e00 2c78 0024 0002 438a 2520 46ec 35c8 3280 24d0 0000 0012 0508 0014 37f0 3cf4 234c
4146640  000b 7b50 0000 0000 0016 4ba5 0018 f644 0018 f408 0011 7072 6f63 626f 6479 5f72 6561 6c5f 696f 7300 0012 0698 0300 80b7
4146720  0000 3287 0000 000c 0018 700c 0018 700c 0001 0084 0000 0000 000b 6465 6c5f 706f 7274 7261 7900 0000 0014 6275 696c 645f
4147000  6772 6170 695f 7072 6f63 626f 6479 0000 0012 06b8 0600 80bf 0000 3287 0000 0018 0018 7090 0018 7090 0001 0084 0000 0000
4147060  2c78 0010 0002 438a 239c 0000 0018 b774 0012 0704 0600 80c7 0000 3287 0000 0018 000a 18f0 0002 438a 0003 0084 0000 0000
4147140  000b 5041 5254 4954 494f 4e45 5200 0000 000c 696e 6974 5f64 6973 706c 6179 0000 000f 696e 6974 5f66 6c6f 775f 6772 6170
4147220  6800 0000 0012 0724 0000 80cf 0000 3287 0000 0000 0018 b754 0018 b754 0001 0084 0000 0000 000b 6164 645f 706f 7274 7261
4147300  7900 0000 2c78 0010 0002 438a 239c 0000 0018 b774 0015 a7d8 0000 80d7 0000 3287 0000 0000 0018 a150 0018 a150 0001 0087
4147360  0000 0000 000b 6469 7370 6c61 795f 6466 6700 0000 001b 2020 2020 2044 6973 706c 6179 696e 6720 666c 6f77 2067 7261 7068
4147440  2e00 0000 0016 44f0 0100 80df 0000 3287 0000 0004 0018 71a8 0018 71a8 0001 0084 0000 0000 0000 857f b328 0000 0018 bf88
4147520  0000 0000 0015 a958 0500 80e7 0000 3287 0000 0014 0018 b918 0018 b918 0001 0084 0000 0000 0015 a9b8 0000 80ef 0000 3287
4147600  0000 0000 0018 49bc 0018 49bc 0001 0087 0000 0000 001c 6d61 7962 655f 7363 6865 6475 6c65 5f61 7361 705f 7072 6f63 626f
4147660  6479 0000 001e 2020 2020 2047 656e 6572 6174 696e 6720 4153 4150 2073 6368 6564 756c 652e 0000 0000 0012 0868 0200 8107
4147740  0000 3287 0000 0008 0018 7280 0018 729c 0001 0084 0000 0000 000a 6164 6470 6f72 7472 6179 0000 0000 0015 8530 0500 8117
4150020  0000 3287 0000 0014 0018 b8c8 0018 b8c8 0001 0084 0000 0000 0000 857f b328 0000 0018 bfb4 0000 0000 2c78 0020 0002 438a
4150100  3754 001c 0018 373c 0018 36b8 3640 320c 239c 0000 0018 b8f8 0018 b898 0600 8117 0000 3287 0000 0018 0018 737c 0018 737c
4150160  0001 0084 0000 0000 0000 81a7 b328 b988 0018 3e80 0000 0000 2c78 0020 0002 438a 3754 001c 0018 373c 0018 36b8 3640 320c
4150240  239c 0000 0018 b948 0018 b7e4 0600 80e7 0000 3287 0000 0018 0018 7450 0018 747c 0001 0084 0000 0000 000c 7265 6d6f 7665
4150320  6462 5f64 6667 0000 0015 8550 0500 811f 0000 3287 0000 0014 0018 750c 0018 750c 0001 0084 0000 0000 0000 818f b328 bd08
4150400  0018 3d40 0000 0000 0018 b968 0600 811f 0000 3287 0000 0018 0018 7570 0018 7570 0001 0084 0000 0000 000e 6469 7370 6c61
4150460  795f 6f62 6a65 6374 0000 0000 0015 8570 0100 8127 0000 3287 0000 0004 0018 b9fc 0018 ad50 0001 0084 0000 0000 000a 7772
4150540  6974 655f 7668 646c 0000 0000 27f0 0020 0018 ba3c 45c4 37f0 3280 247c 0012 50f0 0014 37f0 3cf4 234c 0018 ba2c 0018 b9cc
4150620  0200 8127 0000 3287 0000 0008 0018 7638 0018 7638 0001 0084 0000 0000 28c4 0000 0018 ad50 2ca0 0000 0000 0000 0000 0001
4150700  0018 75d4 0018 ad50 0002 438a 0018 ba60 0018 75e0 001c 6469 7370 6c61 795f 6f62 6a65 6374 5f73 656c 6563 745f 736f 7572
4150760  6365 0000 0012 7668 646c 5f73 6f75 7263 655f 7769 6e64 6f77 0000 0000 0018 ba1c 0300 8127 0000 3287 0000 000c 0018 badc
4151040  0018 bb18 0001 0084 0000 0000 0012 0948 0300 812f 0000 3287 0000 000c 0018 bb8c 0018 ad14 0001 0084 0000 0000 27f0 0000
4151120  0018 bb18 2ca0 0000 0000 0004 0000 0002 0018 76fc 0018 bb18 0002 438a 0018 a068 0001 4e00 0010 6465 636c 6172 6174 696f
4151200  6e5f 7479 7065 0000 2954 0024 0002 438a 36a4 35ec 447c 0000 0200 0daf 4b8c 0000 0000 61bf 6c08 22bc 0016 46ac 0012 7365
4151260  6c65 6374 5f73 6f75 7263 655f 6c69 6e65 0000 0000 0000 81a7 b328 0000 0018 3e28 0000 0000 0004 696e 6974 0084 0012 0abc
4151340  0200 815f 0000 3287 0000 0008 0018 7998 0018 7998 0001 0084 0000 0000 27f0 0000 0018 ad14 2ca0 0000 0000 0004 0000 0002
4151420  0018 78f0 0018 ad14 0002 438a 0018 bbb0 0018 7930 0018 78fc 000b 7668 646c 5f73 6f75 7263 6500 0000 000b 7365 6c65 6374
4151500  5f6c 696e 6500 0000 0000 818f b328 0000 0018 3414 0000 0000 0012 0adc 0200 8167 0000 3287 0000 0008 0019 287c 0019 287c
4151560  0001 0086 0000 0000 2c78 0010 0002 438a 239c 0000 000b 66d0 0017 a0bc 0200 3a67 0000 3287 0000 0008 0018 bc38 0018 bc38
4151640  0041 0000 0000 0000 2c78 0010 0002 438a 239c 0000 000b 6700 0015 35fc 0300 2e7f 0000 3287 0000 000c 0018 bc68 0018 bc68
4151720  0041 0000 0000 0000 2c78 0010 0002 438a 239c 0000 000b 6730 0013 3654 0300 3a6f 0000 3287 0000 000c 0018 bc98 0018 bc98
4152000  0041 0000 0000 0000 2c78 0010 0002 438a 239c 0000 000b 6760 0011 3aac 0300 3a77 0000 3287 0000 000c 0018 bcc8 0018 bcc8
4152060  0041 0000 0000 0000 2c78 0010 0002 438a 239c 0000 000b 6790 0013 34a8 0300 3a7f 0000 3287 0000 000c 0018 bcf8 0018 bcf8
4152140  0041 0000 0000 0000 2c78 0010 0002 438a 239c 0000 000b 67d0 000d 7363 6865 6d61 7469 6373 2e70 6c00 0004 6364 6667 0000
```

```
4152220  0018 dfb4 0018 b5cc 29c8 ace8 0018 be24 0019 9432 0008 7668 646c 5f70 6f73 00d8 0009 7e6e 7e70 626c 6f63 6b00 2b24 30c0
4152300  0002 438a 0019 5720 2b24 bd50 0002 438a 0018 5548 2aa8 bd5c 0018 bd58 0018 550c 0009 7365 745f 6c61 6265 6c00 0006 6861
4152360  6e64 6c65 0018 bd88 0007 6861 6e64 6c65 7300 b494 0009 6d61 6b65 5f74 6578 7400 0008 6d61 6b65 5f62 6f78 00ac 0006 6172
4152440  726f 7773 0018 bdb8 0006 7075 7270 6c65 0018 b1c4 2954 000a 0002 438a 228c bdd0 0009 7265 6c61 7469 6f6e 7300 0006 7265
4152520  6c61 7465 0018 bde8 0008 6e65 775f 6c69 6e6b 00f4 2954 000a 0002 438a 228c be00 0008 6e65 775f 6e6f 6465 000c 0009 636f
4152600  6c6f 725f 6d61 7000 b464 ace8 000a 2c90 0019 ace4 2b24 bd2c 0002 438a 0019 9d56 0009 6e6f 6465 636f 756e 7400 0009 7e6e
4152660  7e70 6265 6769 6e00 0018 bfec 0000 0038 0019 d4d6 0018 bfec 0000 002c b288 b66c 0000 125b 7fff ffff 0019 30e8 0200 0db5
4152740  0100 15ad 0100 33fd 0000 000b 0000 315f 0034 2f68 6f6d 652f 6f73 6173 312f 612f 7669 6a61 792f 5648 444c 2f70 6172 7365
4153020  722f 7072 6f6c 6f67 2f6e 6577 6e65 772f 7633 2e31 2f77 7269 7465 5f76 6864 6c00 0040 2f68 6f6d 652f 6f73 6173 312f 612f
4153100  7669 6a61 792f 5648 444c 2f70 6172 7365 722f 7072 6f6c 6f67 2f6e 6577 6e65 772f 7633 2e31 2f77 7269 7465 5f76 6864 6c2e
4153160  706c 006a 0036 2f68 6f6d 652f 6f73 6173 312f 612f 7669 6a61 792f 5648 444c 2f70 6172 7365 722f 7072 6f6c 6f67 2f6e 6577
4153240  6e65 772f 7633 2e31 2f72 746c 0042 6c6f 0039 2f68 6f6d 652f 6f73 6173 312f 612f 7669 6a61 792f 5648 444c 2f70 6172 7365
4153320  722f 7072 6f6c 6f67 2f6e 6577 6e65 772f 7633 2e31 2f72 746c 2e70 6c00 0000 002c 0018 c100 b27c b66c 0000 125e 7fff ffff
4153400  0018 3e24 0200 0db5 0200 2f35 0000 857f 0000 0443 0000 315f 0000 002c 0019 3114 b27c b66c 0000 12a5 7fff ffff 0018 c158
4153460  0200 0db5 0200 224d 0000 857f 0000 3287 0000 315f 0010 6765 6e5f 6172 6368 6974 6563 7475 7265 0000 0018 c128 0000 002c
4153540  b27c b66c 0000 1260 0000 12a4 000a d16d 0200 0db5 0200 270d 0000 857f 0000 3287 0000 315f 002e 2f68 6f6d 652f 6f73 6173
4153620  322f 622f 7175 696e 7475 732f 7077 312e 312f 6c69 6272 6172 792f 6164 6470 6f72 7472 6179 0073 2729 0031 2f68 6f6d 652f
4153700  6f73 6173 322f 622f 7175 696e 7475 732f 7077 312e 312f 6c69 6272 6172 792f 6164 6470 6f72 7472 6179 2e70 6c00 0039 2f68
4153760  6f6d 652f 6f73 6173 322f 622f 7175 696e 7475 732f 6765 6e65 7269 632f 7170 6c69 6232 2e35 2f6c 6962 7261 7279 2f61 6464
4154040  706f 7274 7261 7900 003c 2f68 6f6d 652f 6f73 6173 322f 622f 7175 696e 7475 732f 6765 6e65 7269 632f 7170 6c69 6232 2e35
4154120  2f6c 6962 7261 7279 2f61 6464 706f 7274 7261 792e 706c 0065 0000 002c 0019 30e8 b27c b66c 0000 1263 7fff ffff 0018 bf84
4154200  0200 0db5 0200 2f35 0000 85b7 0000 044b 0000 315f 0018 c488 0000 002c b288 b66c 0000 1262 7fff ffff 0018 c100 0200 0db5
4154260  0100 15ad 0100 33fd 0000 000b 0000 315f 0000 002c 0018 bfb0 b27c b66c 0000 1284 7fff ffff 0018 3d3c 0200 0db5 0200 224d
4154340  0000 85b7 0000 85bf 0000 315f 000f 7e6e 7e70 656e 6420 7072 6f63 6573 7300 0000 0000 002c 0018 c458 b27c b66c 0000 1285
4154420  7fff ffff 0007 ded5 0200 0db5 0200 24bd 0000 3287 0000 85bf 0000 315f 0000 002c 0011 7768 b27c b66c 0000 1267 7fff ffff
4154500  0007 dfd5 0200 0db5 0200 284d 0000 85bf 0000 85b7 0000 315f 0000 0034 0018 1f94 b27c b66c 0000 1268 7fff ffff 0018 c224
4154560  0200 0db5 0400 242d 0000 85bf 0000 000b 0000 85bf 0000 21cf 0000 315f 0000 0034 0018 c1f0 b27c b66c 0000 1269 7fff ffff
4154640  0018 c258 0200 0db5 0400 242d 0000 85c7 0000 000b 0000 85bf 0000 21cf 0000 315f 0000 0034 0018 c224 b27c b66c 0000 126a
4154720  7fff ffff 0018 c28c 0200 0db5 0400 242d 0000 85cf 0000 000b 0000 85bf 0000 21cf 0000 315f 0000 0034 0018 c258 b27c b66c
4155000  0000 126b 7fff ffff 0018 c2c0 0200 0db5 0400 242d 0000 85d7 0000 000b 0000 85bf 0000 21cf 0000 315f 0000 0034 0018 c28c
4155060  b27c b66c 0000 126c 7fff ffff 0018 c2f4 0200 0db5 0400 242d 0000 85df 0000 001b 0000 85bf 0000 21cf 0000 315f 0000 0034
4155140  0018 c2c0 b27c b66c 0000 126d 7fff ffff 0007 a7f9 0200 0db5 0400 242d 0000 85e7 0000 001b 0000 85bf 0000 21cf 0000 315f
4155220  0000 0030 0018 2284 b27c b66c 0000 126e 7fff ffff 0018 c358 0200 0db5 0200 2855 0100 85bd 0000 000b 0000 85bf 0000 315f
4155300  0000 0030 0018 c328 b27c b66c 0000 126f 7fff ffff 0018 c388 0200 0db5 0200 2855 0100 85c5 0000 000b 0000 85bf 0000 315f
4155360  0000 0030 0018 c358 b27c b66c 0000 1270 7fff ffff 0018 c3b8 0200 0db5 0200 2855 0100 85cd 0000 0013 0000 85bf 0000 315f
4155440  0000 0030 0018 c388 b27c b66c 0000 1271 7fff ffff 0018 c3e8 0200 0db5 0200 2855 0100 85d5 0000 0013 0000 85bf 0000 315f
4155520  0000 0038 0018 c3b8 b27c b66c 0000 1272 7fff ffff 0018 c420 0200 0db5 0200 2855 0300 85dd 0000 0daf 0000 0ab7 0000 0ab7
4155600  0000 85bf 0000 315f 0000 0038 0018 c3e8 b27c b66c 0000 1273 7fff ffff 0007 d6dd 0200 0db5 0200 2855 0300 85e5 0000 0daf
4155660  0000 0ab7 0000 0ab7 0000 85bf 0000 315f 0000 002c 0018 79f4 b27c b66c 0000 1275 7fff ffff 0018 c198 0200 0db5 0200 24bd
4155740  0000 85bf 0000 31c7 0000 315f 0014 7c7c 0000 0000 0018 cc64 0000 0768 b288 b66c 0000 1274 7fff ffff 0018 c458 0200 0db5
4156020  0100 15ad 0100 33fd 0200 0b3d 0000 1f77 0000 000b 0000 315f 0018 c4f0 0000 0034 b288 b66c 0000 1274 7fff ffff 0018 c48c
4156100  0200 0db5 0100 15ad 0100 33fd 0200 0b3d 0000 1fd7 0000 000b 0000 315f 0018 c524 0000 0034 b288 b66c 0000 1274 7fff ffff
4156160  0018 c4c0 0200 0db5 0100 15ad 0100 33fd 0200 0b3d 0000 1ff7 0000 000b 0000 315f 0018 c558 0000 0034 b288 b66c 0000 1274
4156240  7fff ffff 0018 c4f4 0200 0db5 0100 15ad 0100 33fd 0200 0b3d 0000 240f 0000 000b 0000 315f 0018 c58c 0000 0034 b288 b66c
4156320  0000 1274 7fff ffff 0018 c528 0200 0db5 0100 15ad 0100 33fd 0200 0b3d 0000 2c1f 0000 000b 0000 315f 0018 c5c0 0000 0034
4156400  b288 b66c 0000 1274 7fff ffff 0018 c55c 0200 0db5 0100 15ad 0100 33fd 0200 0b3d 0000 2edf 0000 000b 0000 315f 0018 c5f4
4156460  0000 0034 b288 b66c 0000 1274 7fff ffff 0018 c590 0200 0db5 0100 15ad 0100 33fd 0200 0b3d 0000 301f 0000 000b 0000 315f
4156540  0018 c628 0000 0034 b288 b66c 0000 1274 7fff ffff 0018 c5c4 0200 0db5 0100 15ad 0100 33fd 0200 0b3d 0000 309f 0000 0013
4156620  0000 315f 0018 c65c 0000 0034 b288 b66c 0000 1274 7fff ffff 0018 c5f8 0200 0db5 0100 15ad 0100 33fd 0200 0b3d 0000 28a7
4156700  0000 001b 0000 315f 0018 c690 0000 0034 b288 b66c 0000 1274 7fff ffff 0018 c62c 0200 0db5 0100 15ad 0100 33fd 0200 0b3d
4156760  0000 28a7 0000 0023 0000 315f 0018 c6c4 0000 0034 b288 b66c 0000 1274 7fff ffff 0018 c660 0200 0db5 0100 15ad 0100 33fd
4157040  0200 0b3d 0000 2ecf 0000 001b 0000 315f 0018 c6f8 0000 0034 b288 b66c 0000 1274 7fff ffff 0018 c694 0200 0db5 0100 15ad
4157120  0100 33fd 0200 0b3d 0000 2ecf 0000 0023 0000 315f 0018 c72c 0000 0034 b288 b66c 0000 1274 7fff ffff 0018 c6c8 0200 0db5
4157200  0100 15ad 0100 33fd 0200 0b3d 0000 281f 0000 001b 0000 315f 0018 c760 0000 0034 b288 b66c 0000 1274 7fff ffff 0018 c6fc
4157260  0200 0db5 0100 15ad 0100 33fd 0200 0b3d 0000 28b7 0000 002b 0000 315f 0018 c794 0000 0034 b288 b66c 0000 1274 7fff ffff
```

```
4157340 0018 c730 0200 0db5 0100 15ad 0100 33fd 0200 0b3d 0000 28bf 0000 001b 0000 315f 0018 c7c8 0000 0034 b288 b66c 0000 1274
4157420 7fff ffff 0018 c764 0200 0db5 0100 15ad 0100 33fd 0200 0b3d 0000 28c7 0000 001b 0000 315f 0018 c7fc 0000 0034 b288 b66c
4157500 0000 1274 7fff ffff 0018 c798 0200 0db5 0100 15ad 0100 33fd 0200 0b3d 0000 28cf 0000 001b 0000 315f 0018 c830 0000 0034
4157560 b288 b66c 0000 1274 7fff ffff 0018 c7cc 0200 0db5 0100 15ad 0100 33fd 0200 0b3d 0000 28d7 0000 001b 0000 315f 0018 c864
4157640 0000 0034 b288 b66c 0000 1274 7fff ffff 0018 c800 0200 0db5 0100 15ad 0100 33fd 0200 0b3d 0000 28df 0000 001b 0000 315f
4157720 0018 c898 0000 0034 b288 b66c 0000 1274 7fff ffff 0018 c834 0200 0db5 0100 15ad 0100 33fd 0200 0b3d 0000 28e7 0000 001b
4160000 0000 315f 0018 c8cc 0000 0034 b288 b66c 0000 1274 7fff ffff 0018 c868 0200 0db5 0100 15ad 0100 33fd 0200 0b3d 0000 28ef
4160060 0000 001b 0000 315f 0018 c900 0000 0034 b288 b66c 0000 1274 7fff ffff 0018 c89c 0200 0db5 0100 15ad 0100 33fd 0200 0b3d
4160140 0000 28f7 0000 001b 0000 315f 0018 c934 0000 0034 b288 b66c 0000 1274 7fff ffff 0018 c8d0 0200 0db5 0100 15ad 0100 33fd
4160220 0200 0b3d 0000 28ff 0000 001b 0000 315f 0018 c968 0000 0034 b288 b66c 0000 1274 7fff ffff 0018 c904 0200 0db5 0100 15ad
4160300 0100 33fd 0200 0b3d 0000 2907 0000 0023 0000 315f 0018 c99c 0000 0034 b288 b66c 0000 1274 7fff ffff 0018 c938 0200 0db5
4160360 0100 15ad 0100 33fd 0200 0b3d 0000 290f 0000 001b 0000 315f 0018 c9d0 0000 0034 b288 b66c 0000 1274 7fff ffff 0018 c96c
4160440 0200 0db5 0100 15ad 0100 33fd 0200 0b3d 0000 2917 0000 001b 0000 315f 0018 ca04 0000 0034 b288 b66c 0000 1274 7fff ffff
4160520 0018 c9a0 0200 0db5 0100 15ad 0100 33fd 0200 0b3d 0000 291f 0000 001b 0000 315f 0018 ca3c 0000 0038 b27c b66c 0000 1276
4160600 0000 1286 0018 ca6c 0200 0db5 0500 1cdd 0000 2def 0000 000b 0000 85bf 00cc 9883 0000 044b 0000 315f 0018 ca68 0000 002c
4160660 b4f0 b4e4 0000 1275 7fff ffff 0008 b0dd 0000 0000 0000 0000 0018 cde4 0002 438a 0019 9794 0018 caa0 0000 0038 b27c b66c
4160740 0000 1278 0000 1287 0018 caa4 0200 0db5 0500 1cdd 0000 85bf 0000 000b 0000 85bf 00cb 8983 0000 044b 0000 315f 0018 cad8
4161020 0000 0038 b27c b66c 0000 1279 0000 1288 0018 cadc 0200 0db5 0500 1cdd 0000 85c7 0000 000b 0000 85bf 00cb 8b03 0000 044b
4161100 0000 315f 0018 cb10 0000 0038 b27c b66c 0000 127a 0000 1289 0018 cb14 0200 0db5 0500 1cdd 0000 85cf 0000 000b 0000 85bf
4161160 00cb 8c83 0000 044b 0000 315f 0018 cb48 0000 0038 b27c b66c 0000 127b 0000 128a 0018 cb4c 0200 0db5 0500 1cdd 0000 85d7
4161240 0000 000b 0000 85bf 00cb 8e03 0000 044b 0000 315f 0018 cb80 0000 0038 b27c b66c 0000 127c 0000 128b 0018 cb84 0200 0db5
4161320 0500 1cdd 0000 85df 0000 001b 0000 85bf 00cb 8f83 0000 044b 0000 315f 0018 cbb8 0000 0038 b27c b66c 0000 127d 0000 128c
4161400 0018 cbbc 0200 0db5 0500 1cdd 0000 85e7 0000 001b 0000 85bf 00cb 9103 0000 044b 0000 315f 0018 cc64 0000 0038 b27c b66c
4161460 0000 127e 0000 128d 0018 cc68 0200 0db5 0500 1cdd 0000 85df 0000 0023 0000 85bf 00cc 9fc3 0000 044b 0000 315f 2c78 0074
4161540 0002 438a 2520 34c0 0020 34e0 001c 4290 0000 0018 0000 3287 24d0 0000 0019 9558 0018 2e7c adec 2ba0 0018 0022 37dc 43c0
4161620 0200 0daf 4b8c 0000 0000 3287 6450 247c 0008 b91c 0018 aa50 2e98 22a0 2c58 43e4 0200 0db7 6d50 6d0c 447c 0000 0200 0daf
4161700 4b8c 0000 0000 3287 6bb4 234c 0008 b2bc 0018 ccfc 0000 0038 b27c b66c 0000 127f 0000 128e 0018 cd00 0200 0db5 0500 1cdd
4161760 0050 85e7 0000 0023 0000 85bf 00cc a303 0000 044b 0000 315f 2c78 0060 0002 438a 2520 34e0 0020 3500 001c 4290 0000 0018
4162040 0000 3287 24d0 0000 0019 9558 0018 2e7c ad54 2ba0 0018 002e 44a0 0000 0200 0db7 6d94 6d50 447c 0000 0200 0daf 4b8c 0000
4162120 0000 3287 6bb4 247c 0008 db5c 0010 aa18 2e98 22a0 2c58 723c 0018 cde0 0000 0038 b27c b66c 0000 1280 0000 128f 0018 cde4
4162200 0200 0db5 0500 1cdd 0000 85f7 0000 003b 0000 85bf 00cc aac3 0000 044b 0000 315f 28c4 00aa 0019 95c4 45e8 0020 4728 0024
4162260 477c 47f8 0028 4d2c 0018 4880 001c 001c 4848 0020 9350 0020 9860 3050 3894 0028 4254 0000 0000 0013 3af4 0024 0008 cebc
4162340 002c 3894 0028 41e8 0000 001b 3c48 0000 0008 ce1c 0028 3880 382c 0024 37c4 001c 6f34 3880 382c 0020 3280 6f34 3844 382c
4162420 001c 3aa0 0019 95d4 0018 2e7c ac08 2ba0 0018 0016 37f0 4cc4 0000 3287 a858 2e98 3774 4a7c 0014 723c 2c58 379c 5d10 0000
4162500 0200 0daf 6d50 6d0c 723c 5f2c 0018 ce94 0000 0078 b130 b66c 0000 1281 0000 1290 0018 ca41 0200 0db5 0500 1cdd 0000 85ff
4162560 0000 001b 0000 85bf 00cc aea3 0000 044b 0000 315f 0018 ce94 0000 0040 0000 0000 0000 0000 0000 0000 0000 0000 0000 0000
4162640 0019 9398 0019 9408 0019 9470 0019 94a8 0019 9418 0019 951c 0000 0000 0019 9568 0019 95fc 2c78 003c 0002 438a 45d0 46d8
4162720 4754 aa50 aab4 C0C0 a554 0004 22a0 33f4 37dc 379c 6e74 3d78 37f0 379c 6e74 aa50 aaf0 ffff ac08 3858 37dc 234c 0019 95d4
4163000 0018 e12c 0000 1088 7374 2850 6f70 7570 2c20 6170 7065 6e64 2c20 5365 6c65 6374 696f 6e73 292e 200a 2f2a 0a74 6573 7462
4163060 203a 2d0a 0970 726f 7461 6c6b 2c0a 0969 6e69 742c 0a09 6469 7370 6c61 795f 746f 705f 6c65 7665 6c2c 0a09 6e65 775f 636c
4163140 6173 7328 626c 6f63 6b2c 626c 6f63 6b29 2c0a 096e 6577 5f73 7562 636c 6173 7328 7668 646c 5f73 6f75 7263 652c 205b 626c
4163220 6f63 6b5d 2c20 7668 646c 5f73 6f75 7263 6529 2c0a 096e 6577 5f73 7562 636c 6173 7328 666c 6f77 5f67 7261 7068 2c20 5b62
4163300 6c6f 636b 5d2c 2066 6c6f 775f 6772 6170 6829 2c0a 096e 6577 5f73 7562 636c 6173 7328 636c 7573 7465 7273 2c20 5b62 6c6f
4163360 636b 5d2c 2063 6c75 7374 6572 7329 2c0a 0a09 6e65 7728 7673 312c 2076 6864 6c5f 736f 7572 6365 292c 0a09 6e65 7728 6466
4163440 672c 2066 6c6f 775f 6772 6170 6829 2c0a 0961 7373 6572 7428 7668 646c 5f66 696c 6528 2768 616c 312e 7668 646c 2729 292e
4163520 0a2a 2f0a 7465 7374 7275 6e20 3a2d 0a09 7072 6f74 616c 6b2c 0a09 696e 6974 2c0a 0a09 6e65 775f 636c 6173 7328 626c 6f63
4163600 6b2c 626c 6f63 6b29 2c0a 096e 6577 5f73 7562 636c 6173 7328 7668 646c 5f73 6f75 7263 652c 5b62 6c6f 636b 5d2c 7668 646c
4163660 5f73 6f75 7263 6529 2c0a 096e 6577 5f73 7562 636c 6173 7328 666c 6f77 5f67 7261 7068 2c5b 626c 6f63 6b5d 2c66 6c6f 775f
4163740 6772 6170 6829 2c0a 096e 6577 5f73 7562 636c 6173 7328 636c 7573 7465 7273 2c5b 626c 6f63 6b5d 2c63 6c75 7374 6572 7329
4164020 2c0a 096e 6577 5f73 7562 636c 6173 7328 7061 7274 6974 696f 6e73 2c5b 626c 6f63 6b5d 2c70 6172 7469 7469 6f6e 7329 2c0a
4164100 096e 6577 5f73 7562 636c 6173 7328 6573 7469 6d61 746f 722c 5b62 6c6f 636b 5d2c 6573 7469 6d61 746f 7229 2c0a 0a09 6e65
4164160 7728 7673 312c 2076 6864 6c5f 736f 7572 6365 292c 0a09 6e65 7728 6466 672c 2066 6c6f 775f 6772 6170 6829 2c0a 096e 6577
4164240 286b 6c75 7374 6572 2c20 636c 7573 7465 7273 292c 0a09 6e65 7728 7061 7274 2c20 7061 7274 6974 696f 6e73 292c 0a09 6e65
4164320 7728 6573 7469 6d61 7465 2c20 6573 7469 6d61 746f 7229 2c0a 0961 7373 6572 7428 7668 646c 5f66 696c 6528 2768 616c 312e
4164400 7668 646c 2729 292c 0a09 0a25 096d 6179 6265 5f6e 6577 2840 7069 632c 2070 6963 7475 7265 2827 5041 5254 4954 494f 4e45
```

```
4164460  523a 2054 4f50 4c45 5645 4c27 2c20 7369 7a65 2832 3030 2c33 3530 2929 292c 0a09 6d61 7962 655f 6e65 775f 7069 6374 7572
4164540  6528 4070 6963 2c27 5041 5254 4954 494f 4e45 5227 2c73 697a 6528 3230 302c 3435 3029 292c 0a09 7365 6e64 2840 7069 632c
4164620  206f 7065 6e29 2c20 7365 6e64 2840 7069 632c 2065 7870 6f73 6529 2c0a 0973 656e 6428 7673 312c 2064 6973 706c 6179 5f6f
4164700  6e2c 2040 7069 6329 2c0a 0973 656e 6428 6466 672c 2064 6973 706c 6179 5f6f 6e2c 2040 7069 6329 2c0a 0973 656e 6428 6b6c
4164760  7573 7465 722c 2064 6973 706c 6179 5f6f 6e2c 2040 7069 6329 2c0a 0973 656e 6428 7061 7274 2c20 6469 7370 6c61 795f 6f6e
4165040  2c20 4070 6963 292c 0a09 7365 6e64 2865 7374 696d 6174 652c 2064 6973 706c 6179 5f6f 6e2c 2040 7069 6329 2c0a 0977 7269
4165120  7465 2827 546f 6f6c 2069 6e76 6f6b 6564 2073 7563 6365 7373 6675 6c6c 7927 292c 6e6c 2c0a 0970 726f 6365 7373 5f63 616c
4165200  6c62 6163 6b73 2866 6169 6c29 2e0a 0a72 6573 756d 6520 3a2d 0a09 7365 6e64 2840 7069 632c 206f 7065 6e29 2c0a 0973 656e
4165260  6428 4070 6963 2c20 6578 706f 7365 292c 0a09 7072 6f63 6573 735f 6361 6c6c 6261 636b 7328 6661 696c 292e 0a28 4f62 6a65
4165340  6374 2c20 7365 745f 7374 6174 652c 2070 726f 6365 7373 6564 292e 0a25 0964 6973 706c 6179 5f66 6c6f 775f 6772 6170 6828
4165420  6861 6c31 292e 0a0a 666c 6f77 5f67 7261 7069 2865 7865 6375 7465 2c20 4f62 6a65 6374 2920 3a2d 0a09 7365 6e64 284f 626a
4165500  6563 742c 2073 6574 5f73 7461 7465 2c20 7072 6f63 6573 7369 6e67 292c 0a09 280a 2509 0973 656e 6428 4f62 6a65 6374 2c20
4165560  6765 745f 7374 6174 7573 2c20 5374 6174 7573 292c 0a25 0909 5374 6174 7573 203d 2075 6e70 726f 6365 7373 6564 2c0a 0909
4165640  7472 7565 2c0a 0909 280a 0909 0976 6864 6c5f 6669 6c65 2856 4844 4c46 696c 654e 616d 6529 2c0a 0909 0966 6f72 6d61 7428
4165720  2743 6f6d 7069 6c69 6e67 207e 612e 7e6e 272c 205b 5648 444c 4669 6c65 4e61 6d65 5d29 2c0a 0909 0963 6f6d 7069 6c65 5f76
4166000  6864 6c28 5648 444c 4669 6c65 4e61 6d65 292c 0a09 0909 7365 6e64 284f 626a 6563 742c 2073 6574 5f73 7461 7475 732c 2070
4166060  726f 6365 7373 6564 292c 0a09 0909 7772 6974 6528 2743 6f6d 7069 6c61 7469 6f6e 2063 6f6d 706c 6574 6564 2e27 292c 6e6c
4166140  0a09 093b 0a09 0909 7772 6974 6528 2743 6f6d 7069 6c61 7469 6f6e 2066 6169 6c65 6427 292c 6e6c 0a09 0929 0a09 3b0a 0909
4166220  7668 646c 5f66 696c 6528 5648 444c 4669 6c65 4e61 6d65 292c 0a09 0966 6f72 6d61 7428 277e 6120 6961 7320 616c 7265 6164
4166300  7920 6265 656e 2063 6f6d 7069 6c65 647e 6e27 2c20 5b56 4844 4c46 696c 654e 616d 655d 290a 0929 2c0a 0973 656e 6428 4f62
4166360  6a65 6374 2c20 7365 745f 7374 6174 652c 2070 726f 6365 7373 6564 292e 0a09 0a25 2525 2525 2525 2525 2525 2525 2525 2525
4166440  2525 2525 2525 2525 2525 2525 2525 2525 2525 2525 2525 2525 2525 2525 2525 2525 2525 2525 2525 2525 2525 2525 2525 2525
4166520  2525 2525 2525 2525 2525 2525 0a25 2520 4d65 7468 6f64 7320 666f 7220 7468 6520 636c 6173 7320 2263 6c75 7374 6572 7322
4166600  0a25 2520 6e65 775f 7375 6263 6c61 7373 2863 6c75 7374 6572 732c 205b 626c 6f63 6b5d 2c20 636c 7573 7465 7273 290a 2525
4166660  2525 2525 2525 2525 2525 2525 2525 2525 2525 2525 2525 2525 2525 2525 2525 2525 2525 2525 2525 2525 2525 2525 2525 2525
4166740  2525 2525 2525 2525 2525 2525 2525 2525 2525 2525 2525 2525 2525 250a 090a 636c 7573 7465 7273 2869 6e69 7469 616c 697a
4167020  652c 204f 626a 6563 742c 2044 6573 6372 6970 7469 6f6e 2920 3a2d 2021 2c0a 0967 656e 6572 6963 5f69 6e69 7469 616c 697a
4167100  6528 4f62 6a65 6374 2c20 4465 7363 7269 7074 696f 6e29 2c0a 0973 656e 6428 4f62 6a65 6374 2c20 696e 6974 292e 0a0a 636c
4167160  7573 7465 7273 296d 6574 686f 642c 205f 2c20 5b69 6e69 742c 2065 7870 6c61 696e 2c20 696e 7370 6563 742c 2065 7865 6375
4167240  7465 5d29 2e0a 0a63 6c75 7374 6572 7328 696e 6974 2c20 4f62 6a65 6374 2920 3a2d 0a09 626c 6f63 6b28 696e 6974 2c20 4f62
4167320  6a65 6374 292c 0a09 7365 6e64 284f 626a 6563 742c 2073 6574 5f6c 6162 656c 2c20 636c 7573 7465 7273 292c 0a09 6665 7463
4167400  6828 626c 6f63 6b5f 7072 6f74 6f2c 204f 626a 6563 742c 2042 6c6f 636b 5f70 726f 746f 292c 0a09 6e65 7728 4669 6775 7265
4167460  2c20 6669 6775 7265 2842 6c6f 636b 5f70 726f 746f 2c20 3530 2c31 3930 2929 2c0a 0961 6464 5f74 6578 7428 4669 6775 7265
4167540  2c20 7465 7874 2863 6c75 7374 6572 732c 2035 302c 3230 2c20 6365 6e74 6572 2929 2c0a 0973 746f 7265 2866 6967 7572 652c
4167620  204f 626a 6563 742c 2046 6967 7572 6529 2c0a 0973 656e 6428 4f62 6a65 6374 2c20 7365 745f 7374 6174 7573 2c20 756e 7072
4167700  6f63 6573 7365 6429 2e0a 0a63 6c75 7374 6572 7328 6578 706c 6169 6e2c 205f 2920 3a2d 0a09 6d61 7962 655f 6e65 7728 4063
4167760  6c75 7374 6572 735f 6865 6c70 7769 6e64 6f77 2c20 7669 6577 2827 4845 4c50 3a20 636c 7573 7465 7273 2729 292c 0a09 7365
4170040  6e64 2840 636c 7573 7465 7273 5f68 656c 7077 696e 646f 772c 2073 697a 652c 2073 697a 6528 3630 302c 3830 2929 2c0a 0973
4170120  656e 6428 4063 6c75 7374 6572 735f 6865 6c70 7769 6e64 6f77 2c20 6f70 656e 292c 0a09 7365 6e64 2840 636c 7573 7465 7273
4170200  5f68 656c 7077 696e 646f 772c 2063 6c65 6172 292c 0a09 6162 736f 6c75 7465 5f66 696c 655f 6e61 6d65 2827 636c 7573 7465
4170260  7273 2e68 656c 7027 2c20 4865 6c70 4669 6c65 292c 0a09 7365 6e64 2840 636c 7573 7465 7273 5f68 656c 7077 696e 646f 772c
4170340  2064 6973 706c 6179 2c20 4865 6c70 4669 6c65 292c 0a09 7365 6e64 2840 636c 7573 7465 7273 5f68 656c 7077 696e 646f 772c
4170420  2065 7870 6f73 6529 2e0a 0a63 6c75 7374 6572 7328 696e 7370 6563 742c 205f 2920 3a2d 0a09 7772 6974 6528 2743 616e 6e6f
4170500  7420 6469 7370 6c61 7920 636c 7573 7465 7273 2e27 292c 6e6c 2e0a 2509 6469 7370 6c61 795f 636c 7573 7465 7273 2e0a 0a63
4170560  6c75 7374 6572 7328 6578 6563 7574 652c 204f 626a 6563 7429 203a 2d0a 0973 656e 6428 4f62 6a65 6374 2c20 7365 745f 7374
4170640  6174 652c 2070 726f 6365 7373 696e 6729 2c0a 0928 0a09 0973 656e 6428 4f62 6a65 6374 2c20 6765 745f 7374 6174 7573 2c20
4170720  5374 6174 7573 292c 0a09 0953 7461 7475 7320 3d20 756e 7072 6f63 6573 7365 642c 0a09 0928 0a09 0909 5072 6f63 426f 6479
4171000  4964 203d 2069 6428 702d 3329 2c0a 0909 0977 7269 7465 2827 436c 7573 7465 7269 6e67 206f 7065 7261 7469 6f6e 732e 2729
4171060  2c6e 6c2c 6e6c 2c0a 0909 0928 5c2b 2064 6973 7461 6e63 6528 5f2c 5f2c 5f29 202d 3e0a 0909 0920 7772 6974 6528 2720 2020
4171140  2020 436f 6d70 7574 696e 6720 6f70 6572 6174 6f72 2d64 6973 7461 6e63 6520 6d61 7472 6978 2e27 292c 6e6c 2c0a 0909 0920
4171220  7072 6f63 626f 6479 5f61 6e64 5f69 6428 5072 6f63 426f 6479 2c20 5072 6f63 426f 6479 4964 292c 0a09 0909 2070 726f 6362
4171300  6f64 795f 6f70 6572 6174 6f72 7328 5072 6f63 426f 6479 2c4f 7065 7261 746f 7249 644c 6973 7429 2c0a 0909 0920 636f 6d70
4171360  7574 655f 6469 7374 616e 6365 5f6d 6174 7269 7828 4f70 6572 6174 6f72 4964 4c69 7374 2c62 7564 5f64 6973 7461 6e63 6532
4171440  292c 0a09 0909 2077 7269 7465 2827 2020 2020 2043 6f6d 7075 7461 7469 6f6e 2063 6f6d 706c 6574 6564 2e27 292c 6e6c 0a09
4171520  0909 203b 2074 7275 6529 2c0a 0909 0970 726f 6362 6f64 795f 6f70 6572 6174 6f72 5f63 6c75 7374 6572 7328 5072 6f63 426f
```

| | | | | | | | | | | | | | | | | | | | | | | | | |
|---|---|---|---|---|---|---|---|---|---|---|---|---|---|---|---|---|---|---|---|---|---|---|---|---|
| 4171600 | 6479 | 4964 | 2c20 | 6469 | 7374 | 616e | 6365 | 292c | 0a09 | 0909 | 7772 | 6974 | 6528 | 2743 | 6c75 | 7374 | 6572 | 696e | 6720 | 636f | 6d70 | 6c65 | 7465 | 642e |
| 4171660 | 2729 | 2c6e | 6c2c | 6e6c | 0a09 | 093b | 0a09 | 0909 | 7772 | 6974 | 6528 | 2743 | 616e | 6e6f | 7420 | 636c | 7573 | 7465 | 7220 | 666c | 6f77 | 2067 | 7261 | 7068 |
| 4171740 | 2e27 | 292c | 6e6c | 0a09 | 0929 | 0a09 | 3b0a | 0909 | 7668 | 646c | 5f66 | 696c | 6528 | 5648 | 444c | 4669 | 6c65 | 4e61 | 6d65 | 292c | 0a09 | 0966 | 6f72 | 6d61 |
| 4172020 | 7428 | 2746 | 6c6f | 7720 | 6772 | 6170 | 6820 | 666f | 7220 | 7e61 | 2068 | 6173 | 2061 | 6c72 | 6561 | 6479 | 2062 | 6565 | 6e20 | 636c | 7573 | 7465 | 7265 | 647e |
| 4172100 | 6e27 | 2c20 | 0a20 | 2020 | 2020 | 2020 | 2020 | 2020 | 2020 | 2020 | 2020 | 2020 | 2020 | 2020 | 205b | 5648 | 444c | 4669 | 6c65 | 4e61 | 6d65 | 5d29 | 0a09 | 292c |
| 4172160 | 0a09 | 7365 | 6e64 | 284f | 626a | 6563 | 742c | 2073 | 6574 | 5f73 | 7461 | 7465 | 2c20 | 7072 | 6f63 | 6573 | 7365 | 6429 | 2e0a | 0a25 | 2525 | 2525 | 2525 | 2525 |
| 4172240 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 4172320 | 2525 | 2525 | 2525 | 2525 | 2525 | 2525 | 2525 | 2525 | 2525 | 2525 | 0a25 | 2520 | 4d65 | 7468 | 6f64 | 7320 | 666f | 7220 | 7468 | 6520 | 636c | 6173 | 7320 | 2270 |
| 4172400 | 6172 | 7469 | 7469 | 6f6e | 7322 | 0a25 | 2520 | 6e65 | 775f | 7375 | 6263 | 6c61 | 7373 | 2870 | 6172 | 7469 | 7469 | 6f6e | 732c | 205b | 626c | 6f63 | 6b5d | 2c20 |
| 4172460 | 7061 | 7274 | 6974 | 696f | 6e73 | 290a | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 4172540 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 250a | 090a | 7061 | 7274 |
| 4172620 | 6974 | 696f | 6e73 | 2869 | 6e69 | 7469 | 616c | 697a | 652c | 204f | 626a | 6563 | 742c | 2044 | 6573 | 6372 | 6970 | 7469 | 6f6e | 2920 | 3a2d | 2021 | 2c0a | 0967 |
| 4172700 | 656e | 6572 | 6963 | 5f69 | 6e69 | 7469 | 0018 | de8c | 0000 | 002c | b288 | b66c | 0000 | 1231 | 7fff | ffff | 0019 | 2694 | 0200 | 0db5 | 0100 | 15ad | 0100 | 33fd |
| 4172760 | 0000 | 000b | 0000 | 315f | 0018 | deb8 | 0000 | 002c | b288 | b66c | 0000 | 1231 | 7fff | ffff | 0018 | de64 | 0200 | 0db5 | 0100 | 15ad | 0100 | 33fd | 0000 | 000b |
| 4173040 | 0000 | 315f | 0018 | def0 | 0000 | 0038 | b27c | b66c | 0000 | 1232 | 0000 | 1248 | 0018 | e130 | 0200 | 0db5 | 0500 | 1cdd | 0000 | 5257 | 0000 | 001b | 0000 | 3287 |
| 4173120 | 00c9 | 34e3 | 0000 | 0433 | 0000 | 315f | 0018 | e12c | 0000 | 002c | b4f0 | b4e4 | 0000 | 1231 | 7fff | ffff | 0008 | b0dd | 0000 | 0000 | 0000 | 0000 | 0018 | fc5c |
| 4173200 | 0002 | 438a | 0019 | 30ec | 28c4 | 005c | 0019 | 26f0 | 4e1c | 0000 | 0000 | 3cd7 | 57b8 | 4af8 | 0000 | 831f | 55f0 | 4af8 | 0000 | 8327 | 55f0 | 4af8 | 0000 | 832f |
| 4173260 | 55f0 | 4af8 | 0000 | 3997 | 55f0 | 4af8 | 0000 | 3857 | 55f0 | 4af8 | 0000 | 8337 | 55f0 | 4af8 | 0000 | 833f | 55f0 | 4af8 | 0000 | 8347 | 55f0 | 4af8 | 0000 | 834f |
| 4173340 | 5370 | 228c | 28c4 | 0034 | 0018 | dfa8 | 4e1c | 0000 | 0000 | 3897 | 2520 | 4754 | 33a0 | 42ac | 0000 | 7767 | 000c | 185c | 0014 | 43e4 | 0100 | 0e4f | 6d50 | 3cf4 |
| 4173420 | 242c | 0000 | 000b | 19ec | 28c4 | 0034 | 0019 | 2750 | 4e1c | 0000 | 0000 | 3857 | 2520 | 4754 | 33a0 | 42ac | 0000 | 7767 | 000c | 185c | 0014 | 43e4 | 0100 | 0e4f |
| 4173500 | 6d50 | 3cf4 | 242c | 0000 | 000b | 16dc | 28c4 | 0048 | 0018 | e064 | 4e1c | 0000 | 0000 | 8357 | 2520 | 46d8 | 4ec4 | 0000 | 0000 | 835f | 4268 | 0000 | 0000 | 835f |
| 4173560 | 37dc | 42ac | 0000 | 2f7f | 000c | 1dbc | 0010 | 41fc | 0000 | 8277 | 4254 | 0000 | 0000 | 3897 | 2420 | 0000 | 0008 | dd9c | 0000 | 0000 | 0000 | 0000 | 0018 | df80 |
| 4173640 | 0019 | 26bc | 0019 | 26fc | 0019 | 271c | 0019 | 275c | 0019 | 277c | 0019 | 27bc | 0019 | 27dc | 0019 | 23dd | 0000 | 0000 | 0000 | 0000 | 0019 | 279c | 0000 | 0000 |
| 4173720 | 0018 | e100 | 28c4 | 0048 | 0018 | e0ac | 4e1c | 0000 | 0000 | 8357 | 2520 | 46d8 | 4ec4 | 0000 | 0000 | 8367 | 4268 | 0000 | 0000 | 8367 | 37dc | 42ac | 0000 | 2f7f |
| 4174000 | 000c | 1dbc | 0010 | 41fc | 0000 | 8277 | 4254 | 0000 | 0000 | 3897 | 2420 | 0000 | 0008 | dd9c | 28c4 | 0048 | 0019 | 2730 | 4e1c | 0000 | 0000 | 8357 | 2520 | 46d8 |
| 4174060 | 4ec4 | 0000 | 0000 | 5fff | 4268 | 0000 | 0000 | 5fff | 37dc | 42ac | 0000 | 2f7f | 000c | 1dbc | 0010 | 41fc | 0000 | 76b7 | 4254 | 0000 | 0000 | 3897 | 2420 | 0000 |
| 4174140 | 0008 | dd9c | 2954 | 0034 | 0002 | 438a | 4e1c | 0000 | 0000 | 837f | 2520 | 4754 | 33a0 | 42ac | 0000 | 7767 | 000c | 185c | 0014 | 3858 | 4254 | 0000 | 0000 | 777f |
| 4174220 | 3cf4 | 234c | 0008 | dd9c | 0018 | e310 | 0000 | 0038 | b27c | b66c | 0000 | 1233 | 0000 | 1249 | 0018 | e314 | 0200 | 0db5 | 0500 | 1cdd | 0000 | 5257 | 0000 | 0013 |
| 4174300 | 0000 | 3287 | 00c9 | 4003 | 0000 | 0433 | 0000 | 315f | 2938 | 01ac | 0018 | a388 | 4e1c | 0000 | 0000 | 831f | 2520 | 46d8 | 4268 | 0000 | 0000 | 5257 | 4254 | 0000 |
| 4174360 | 0000 | 8327 | 3b4c | 0000 | 0008 | dd9c | 0020 | 4408 | 0200 | 3d5f | 4b8c | 0000 | 0000 | 0193 | 4b8c | 0000 | 0000 | 0143 | 4254 | 0000 | 0000 | 8337 | 3b4c | 0000 |
| 4174440 | 0008 | dd9c | 0020 | 43e4 | 0300 | 27bf | 4b8c | 0000 | 0000 | 0003 | 4b8c | 0000 | 0000 | 0003 | 4b8c | 0000 | 0000 | 0003 | 447c | 0000 | 0100 | 0e4f | 6d0c | 247c |
| 4174520 | 000b | 43b0 | 0020 | 4550 | 4b8c | 0000 | 0000 | 8397 | 5370 | 4538 | 4b8c | 0000 | 0000 | 816f | 6bb4 | 4598 | 0018 | 4af8 | 0000 | 838f | 6b74 | 4210 | 0000 | 8387 |
| 4174600 | 44c4 | 0000 | 0100 | 0e4f | 6d0c | 41e8 | 0000 | 06df | 32f0 | 001c | 24d0 | 0000 | 0016 | 4a74 | 0020 | 43e4 | 0200 | 387f | 4b8c | 0000 | 0000 | 773f | 4b8c | 0000 |
| 4174660 | 0000 | 0003 | 32d4 | 247c | 0008 | cf7c | 0020 | 3eec | 001c | 41e8 | 0000 | 774f | 3c48 | 0000 | 0008 | dd9c | 001c | 43e4 | 0200 | 387f | 4b8c | 0000 | 0000 | 5257 |
| 4174740 | 6dd8 | 329c | 24d0 | 0000 | 000b | 43b0 | 0018 | 43e4 | 0400 | 7757 | 4b8c | 0000 | 0000 | 0003 | 4b8c | 0000 | 0000 | 0003 | 4b8c | 0000 | 0000 | 0323 | 4b8c | 0000 |
| 4175020 | 0000 | 0143 | 32b8 | 247c | 0008 | cf7c | 0018 | 4408 | 0100 | 0e4f | 4b8c | 0000 | 0000 | 8277 | 4254 | 0000 | 0000 | 386f | 3bf4 | 0000 | 0008 | dd9c | 0018 | 41fc |
| 4175100 | 0000 | 001b | 4254 | 0000 | 0000 | 775f | 3bf4 | 0000 | 0008 | dd9c | 0018 | 3d6c | 4254 | 0000 | 0000 | 1d17 | 3ba0 | 0000 | 0008 | dd9c | 0014 | 3d60 | 37dc | 41d4 |
| 4175160 | 0000 | 839f | 242c | 0000 | 000c | 1dbc | 0018 | e3a4 | 0000 | 0038 | b27c | b66c | 0000 | 1234 | 0000 | 124a | 0018 | e3a8 | 0200 | 0db5 | 0500 | 1cdd | 0000 | 8167 |
| 4175240 | 0000 | 001b | 0000 | 3287 | 00c9 | 4243 | 0000 | 0433 | 0000 | 315f | 27f0 | 0030 | 0018 | e374 | 4e1c | 0000 | 0000 | 251f | 2520 | 46d8 | 35ec | 3050 | 3b4c | 0000 |
| 4175320 | 000c | 194c | 0010 | 41e8 | 0000 | 831f | 2420 | 0000 | 0008 | dd5c | 2954 | 002c | 0002 | 438a | 4e1c | 0000 | 0000 | 3cd7 | 57b8 | 4af8 | 0000 | 831f | 55f0 | 4af8 |
| 4175400 | 0000 | 838f | 55f0 | 4af8 | 0000 | 816f | 5370 | 228c | 0018 | e730 | 0000 | 0038 | b27c | b66c | 0000 | 1235 | 0000 | 124b | 0018 | e734 | 0200 | 0db5 | 0500 | 1cdd |
| 4175460 | 0000 | 8167 | 0000 | 0013 | 0000 | 3287 | 00c5 | dfc3 | 0000 | 0433 | 0000 | 315f | 27f0 | 00c0 | 0018 | e498 | 4e1c | 0000 | 0000 | 831f | 2520 | 46d8 | 37dc | 42ac |
| 4175540 | 0000 | 831f | 0019 | 2800 | 0018 | 41fc | 0000 | 8167 | 4254 | 0000 | 0000 | 8327 | 3b4c | 0000 | 0008 | dd9c | 0018 | 33d8 | 37dc | 42ac | 0000 | 839f | 000c | 185c |
| 4175620 | 0018 | 43e4 | 0300 | 7767 | 6d94 | 4af8 | 0000 | 0193 | 4b8c | 0000 | 0000 | 00f3 | 329c | 247c | 0008 | cf7c | 0014 | 43e4 | 0400 | 30bf | 4b8c | 0000 | 0000 | 8167 |
| 4175700 | 4b8c | 0000 | 0000 | 0193 | 4b8c | 0000 | 0000 | 00a3 | 4b8c | 0000 | 0000 | 7777 | 3ba0 | 0000 | 0016 | 4a94 | 0014 | 3d60 | 37dc | 42ac | 0000 | 7767 | 000c | 1dbc |
| 4175760 | 0010 | 41fc | 0000 | 835f | 4254 | 0000 | 0000 | 8347 | 2420 | 0000 | 0008 | dd9c | 28c4 | 0104 | 0018 | e59c | 4e1c | 0000 | 0000 | 838f | 2520 | 43e4 | 0100 | 3d4f |
| 4176040 | 4b8c | 0000 | 0000 | 83af | 447c | 0000 | 0100 | 0e4f | 4b8c | 0000 | 0000 | 83a7 | 24d0 | 0000 | 000b | 43b0 | 0010 | 4408 | 0200 | 3d5f | 4b8c | 0000 | 0000 | 12c3 |
| 4176120 | 4b8c | 0000 | 0000 | 03c3 | 4254 | 0000 | 0000 | 3d5f | 447c | 0000 | 0100 | 0e4f | 4b8c | 0000 | 0000 | 83a7 | 24d0 | 0000 | 0008 | dd9c | 0010 | 41e8 | 0000 | 2ae7 |
| 4176200 | 447c | 0000 | 0100 | 0e4f | 4b8c | 0000 | 0000 | 83a7 | 24d0 | 0000 | 0008 | dd5c | 0010 | 41e8 | 0000 | 3d67 | 447c | 0000 | 0100 | 0e4f | 4b8c | 0000 | 0000 | 83a7 |
| 4176260 | 24d0 | 0000 | 0008 | dd5c | 0010 | 3310 | 4300 | 0000 | 0000 | 83b7 | 0008 | b09c | 0010 | 3d54 | 4254 | 0000 | 0000 | 20f7 | 447c | 0000 | 0100 | 0e4f | 4b8c | 0000 |
| 4176340 | 0000 | 83a7 | 24d0 | 0000 | 0008 | dd9c | 000c | 41e8 | 0000 | 823f | 447c | 0000 | 0100 | 0e4f | 4b8c | 0000 | 0000 | 83a7 | 242c | 0000 | 0008 | dd5c | 28c4 | 0140 |
| 4176420 | 0018 | e6dc | 4e1c | 0000 | 0000 | 816f | 2520 | 2c7c | adec | 2ba0 | 0018 | 0122 | 329c | 247c | 0019 | 28e0 | 0018 | aa50 | 2e98 | 43e4 | 0100 | 3d4f | 4b8c | 0000 |
| 4176500 | 0000 | 83c7 | 447c | 0000 | 0100 | 0e4f | 4b8c | 0000 | 0000 | 8137 | 24d0 | 0000 | 000b | 43b0 | 0014 | 4408 | 0200 | 3d5f | 4b8c | 0000 | 0000 | 12c3 | 4b8c | 0000 |
| 4176560 | 0000 | 0af3 | 4254 | 0000 | 0000 | 3d5f | 447c | 0000 | 0100 | 0e4f | 4b8c | 0000 | 0000 | 8137 | 24d0 | 0000 | 0008 | dd9c | 0014 | 41e8 | 0000 | 2ae7 | 447c | 0000 |
| 4176640 | 0100 | 0e4f | 4b8c | 0000 | 0000 | 8137 | 24d0 | 0000 | 0008 | dd5c | 0014 | 41e8 | 0000 | 3d67 | 447c | 0000 | 0100 | 0e4f | 4b8c | 0000 | 0000 | 8137 | 2430 | 0000 |

```
4176720  0008 dd5c 0014 3858 4254 0000 0000 2627 447c 0000 0100 0e4f 4b8c 0000 0000 8137 24d0 0000 0008 dd9c 0014 3310 40e0 0000
4177000  0008 b09c 0010 3d54 4254 0000 0000 20f7 447c 0000 0100 0e4f 4b8c 0000 0000 8137 24d0 0000 0008 dd9c 000c 41e8 0000 823f
4177060  447c 0000 0100 0e4f 4b8c 0000 0000 8137 242c 0000 0008 dd5c 2c58 723c 2954 0050 0002 438a 4e1c 0000 0000 8397 2520 2e7c
4177140  ad64 2ba0 0010 0022 31f0 247c 0019 28e0 0010 aa18 2e98 42ac 0000 83cf 0008 ec1c 000c 234c 0008 d13c 2c58 42ac 0000 83d7
4177220  0008 ec1c 000c 234c 0008 d13c 0018 e7cc 0000 0038 b27c b66c 0000 1236 0000 124c 0018 e7d0 0200 0db5 0500 1cdd 0000 83df
4177300  0000 001b 0000 3287 00c9 4a43 0000 0433 0000 315f 27f0 0030 0018 e794 4e1c 0000 0000 251f 2520 46d8 35ec 3050 3b4c 0000
4177360  000c 194c 0010 41e8 0000 831f 2420 0000 0008 dd5c 2954 0034 0002 438a 4e1c 0000 0000 3cd7 57b8 4af8 0000 831f 55f0 4af8
4177440  0000 838f 55f0 4af8 0000 816f 55f0 4af8 0000 8397 5370 228c 0018 eb2c 0000 0038 b27c b66c 0000 1237 0000 124d 0018 eb30
4177520  0200 0db5 0500 1cdd 0000 83df 0000 0013 0000 3287 00c9 4c63 0000 0433 0000 315f 27f0 00c0 0018 e8c0 4e1c 0000 0000 831f
4177600  2520 46d8 37dc 42ac 0000 831f 0019 2800 0018 41fc 0000 83df 4254 0000 0000 8327 3b4c 0000 0008 dd9c 0018 33d8 37dc 42ac
4177660  0000 839f 000c 185c 0018 43e4 0300 7767 6d94 4af8 0000 0193 4b8c 0000 0000 0373 329c 247c 0008 cf7c 0014 43e4 0400 30bf
4177740  4b8c 0000 0000 83df 4b8c 0000 0000 0193 4b8c 0000 0000 00a3 4b8c 0000 0000 7777 3ba0 0000 0016 4a94 0014 3d60 37dc 42ac
4200020  0000 7767 000c 1dbc 0010 41fc 0000 835f 4254 0000 0000 8347 2420 0000 0008 dd9c 28c4 0104 0018 e9c4 4e1c 0000 0000 838f
4200100  2520 43e4 0100 3d4f 4b8c 0000 0000 83ef 447c 0000 0100 0e4f 4b8c 0000 0000 83e7 24d0 0000 000b 43b0 0010 4408 0200 3d5f
4200160  4b8c 0000 0000 12c3 4b8c 0000 0000 0283 4254 0000 0000 3d5f 447c 0000 0100 0e4f 4b8c 0000 0000 83e7 24d0 0000 0008 dd9c
4200240  0010 41e8 0000 2ae7 447c 0000 0100 0e4f 4b8c 0000 0000 83e7 24d0 0000 0008 dd5c 0010 41e8 0000 3d67 447c 0000 0100 0e4f
4200320  4b8c 0000 0000 83e7 24d0 0000 0008 dd5c 0010 3310 4300 0000 0000 83f7 0008 b09c 0010 3d54 4254 0000 0000 20f7 447c 0000
4200400  0100 0e4f 4b8c 0000 0000 83e7 24d0 0000 0008 dd9c 000c 41e8 0000 823f 447c 0000 0100 0e4f 4b8c 0000 0000 83e7 242c 0000
4200460  0008 dd5c 28c4 0080 0018 ea44 4e1c 0000 0000 816f 2520 46d8 4268 0000 0000 5fff 4254 0000 0000 8357 3b4c 0000 0008 dd9c
4200540  0010 43e4 0200 0ad7 4b8c 0000 0000 6317 4b8c 0000 0000 001b 447c 0000 0100 61bf 6bb4 247c 0018 b7c4 0010 42ac 0000 83ff
4200620  0008 ec1c 0010 247c 0008 d13c 0010 41fc 0000 8367 4254 0000 0000 8357 2420 0000 0008 dd9c 2954 00e4 0002 438a 4e1c 0000
4200700  0000 8397 2520 46d8 4268 0000 0000 5fff 4254 0000 0000 8357 3b4c 0000 0008 dd9c 0014 2ba0 0014 007c 2ba0 0014 005a 329c
4200760  24d0 0000 0019 28e0 0014 4550 6d50 5370 4300 0000 0000 8407 0008 c0fc 0014 39f8 0019 2a94 0014 41fc 0000 8367 4254 0000
4201040  0000 8347 3b4c 0000 0008 dd9c 0014 42ac 0000 8417 0008 ec1c 0014 247c 0008 d13c 0014 2c88 003e 2c58 4300 0000 0000 841f
4201120  0008 ec1c 0014 247c 0008 d13c 0014 2c88 0022 2c58 329c 247c 0019 28e0 0014 4550 6d50 5370 4300 0000 0000 8427 0008 c0fc
4201200  0010 41fc 0000 8367 4254 0000 0000 8357 2420 0000 0008 dd9c 0018 ebc8 0000 0038 b27c b66c 0000 1238 0000 124e 0018 ebcc
4201260  0200 0db5 0500 1cdd 0000 6b37 0000 001b 0000 3287 00c9 55a3 0000 0433 0000 315f 27f0 0030 0018 eb90 4e1c 0000 0000 251f
4201340  2520 46d8 35ec 3050 3b4c 0000 000c 194c 0010 41e8 0000 831f 2420 0000 0008 dd5c 2954 0034 0002 438a 4e1c 0000 0000 3cd7
4201420  57b8 4af8 0000 831f 55f0 4af8 0000 838f 55f0 4af8 0000 816f 55f0 4af8 0000 8397 5370 228c 0018 efd4 0000 0038 b27c b66c
4201500  0000 1239 0000 124f 0018 efd8 0200 0db5 0500 1cdd 0000 6b37 0000 0013 0000 3287 00c9 57c3 0000 0433 0000 315f 27f0 00c0
4201560  0018 ecbc 4e1c 0000 0000 831f 2520 46d8 37dc 42ac 0000 831f 0019 2800 0018 41fc 0000 6b37 4254 0000 0000 8327 3b4c 0000
4201640  0008 dd9c 0018 33d8 37dc 42ac 0000 839f 000c 185c 0018 43e4 0300 7767 6d94 4af8 0000 0193 4b8c 0000 0000 05f3 329c 247c
4201720  0008 cf7c 0014 43e4 0400 30bf 4b8c 0000 0000 6b37 4b8c 0000 0000 0193 4b8c 0000 0000 00a3 4b8c 0000 0000 7777 3ba0 0000
4202000  0016 4a94 0014 3d60 37dc 42ac 0000 7767 000c 1dbc 0010 41fc 0000 835f 4254 0000 0000 8347 2420 0000 0008 dd9c 28c4 0104
4202060  0019 2b74 4e1c 0000 0000 838f 2520 43e4 0100 3d4f 4b8c 0000 0000 8437 447c 0000 0100 0e4f 4b8c 0000 0000 842f 24d0 0000
4202140  000b 43b0 0010 4408 0200 3d5f 4b8c 0000 0000 12c3 4b8c 0000 0000 0283 4254 0000 0000 3d5f 447c 0000 0100 0e4f 4b8c 0000
4202220  0000 842f 24d0 0000 0008 dd9c 0010 41e8 0000 2ae7 447c 0000 0100 0e4f 4b8c 0000 0000 842f 24d0 0000 0008 dd5c 0010 41e8
4202300  0000 3d67 447c 0000 0100 0e4f 4b8c 0000 0000 842f 24d0 0000 0008 dd5c 0010 3310 4300 0000 0000 843f 0008 b09c 0010 3d54
4202360  4254 0000 0000 20f7 447c 0000 0100 0e4f 4b8c 0000 0000 842f 24d0 0000 0008 dd9c 000c 41e8 0000 823f 447c 0000 0100 0e4f
4202440  4b8c 0000 0000 842f 242c 0000 0008 dd5c 0028 2020 2020 2043 6f6d 7075 7469 6e67 206f 7065 7261 746f 722d 6469 7374 616e
4202520  6365 206d 6174 7269 782e 0020 002e 466c 6f77 2067 7261 7068 2066 6f72 207e 6120 6861 7320 616c 7265 6164 7920 6265 656e
4202600  2063 6c75 7374 6572 6564 7e6e 0040 6667 2954 01b0 0002 438a 4e1c 0000 0000 8397 2520 46d8 4268 0000 0000 5fff 4254 0000
4202660  0000 8357 3b4c 0000 0008 dd9c 002c 2ba0 002c 0148 3410 0028 4254 0000 0000 834f 3b4c 0000 0008 dd9c 002c 34f4 0028 4c70
4202740  0000 835f 2ba0 0028 0106 32b8 5d10 0000 0100 61bf 5a18 0000 0200 0ad7 4b8c 0000 0000 6317 4b8c 0000 0000 001b 4300 0000
4203020  0000 844f 0008 ec1c 0028 247c 0008 d13c 0028 247c 0008 d13c 0028 2e7c ae74 0020 2ba0 0028 0086 2e7c ae74 0024 2ba0 0028
4203100  001a 3228 320c 31f0 24d0 0000 0013 7df0 0029 aa88 0024 2e99 c5a8 2c58 aa88 0020 2e98 42ac 0000 8457 0008 ec1c 0020 247c
4203160  0008 d13c 0020 3804 32f0 001c 24d0 0000 000b 3c08 0020 3364 40b4 001c 0012 36d4 001c 41e8 0000 6bb7 4108 0000 0013 7e2c
4203240  0018 42ac 0000 845f 0008 ec1c 0018 247c 0008 d13c 0018 2c88 0004 2c58 4254 0000 0000 6b7f 40f4 0000 0013 7c80 0014 42ac
4203320  0000 8467 0008 ec1c 0014 247c 0008 d13c 0014 247c 0008 d13c 0014 2c88 003e 2c58 4300 0000 0000 846f 0008 ec1c 0014 247c
4203400  0008 d13c 0014 2c88 0022 2c58 329c 247c 0019 28e0 0014 4550 6d50 5370 4300 0000 0000 8477 0008 c0fc 0010 41fc 0000 8367
4203460  4254 0000 0000 8357 2420 0000 0008 dd9c 0018 f070 0000 0038 b27c b66c 0000 123a 0000 1250 0018 f074 0200 0db5 0500 1cdd
4203540  0000 847f 0000 001b 0000 3287 00c9 60e3 0000 0433 0000 315f 27f0 0030 0018 f038 4e1c 0000 0000 251f 2520 46d8 35ec 3050
4203620  3b4c 0000 000c 194c 0010 41e8 0000 831f 2420 0000 0008 dd5c 2954 0034 0002 438a 4e1c 0000 0000 3cd7 57b8 4af8 0000 831f
4203700  55f0 4af8 0000 838f 55f0 4af8 0000 816f 55f0 4af8 0000 8397 5370 228c 0018 f32c 0000 0038 b27c b66c 0000 123b 0000 1251
4203760  0018 f330 0200 0db5 0500 1cdd 0000 847f 0000 0013 0000 3287 00c9 6403 0000 0433 0000 315f 27f0 00c0 0018 f164 4e1c 0000
```

| | | | | | | | | | | | | | | | | | | | | | | | | |
|---|---|---|---|---|---|---|---|---|---|---|---|---|---|---|---|---|---|---|---|---|---|---|---|---|
| 4204040 | 0000 | 831f | 2520 | 46d8 | 37dc | 42ac | 0000 | 831f | 0019 | 2800 | 0018 | 41fc | 0000 | 847f | 4254 | 0000 | 0000 | 8327 | 3b4c | 0000 | 0008 | dd9c | 0018 | 33d8 |
| 4204120 | 37dc | 42ac | 0000 | 839f | 000c | 185c | 0018 | 43e4 | 0300 | 7767 | 6d94 | 4af8 | 0000 | 0193 | 4b8c | 0000 | 0000 | 0873 | 329c | 247c | 0008 | cf7c | 0014 | 43e4 |
| 4204200 | 0400 | 30bf | 4b8c | 0000 | 0000 | 847f | 4b8c | 0000 | 0000 | 0193 | 4b8c | 0000 | 0000 | 00a3 | 4b8c | 0000 | 0000 | 7777 | 3ba0 | 0000 | 0016 | 4a94 | 0014 | 3d60 |
| 4204260 | 37dc | 42ac | 0000 | 7767 | 000c | 1dbc | 0010 | 41fc | 0000 | 835f | 4254 | 0000 | 0000 | 8347 | 2420 | 0000 | 0008 | dd9c | 28c4 | 0104 | 0019 | 2d14 | 4e1c | 0000 |
| 4204340 | 0000 | 838f | 2520 | 43e4 | 0100 | 3d4f | 4b8c | 0000 | 0000 | 848f | 447c | 0000 | 0100 | 0e4f | 4b8c | 0000 | 0000 | 8487 | 24d0 | 0000 | 000b | 43b0 | 0010 | 4408 |
| 4204420 | 0200 | 3d5f | 4b8c | 0000 | 0000 | 12c3 | 4b8c | 0000 | 0000 | 0283 | 4254 | 0000 | 0000 | 3d5f | 447c | 0000 | 0100 | 0e4f | 4b8c | 0000 | 0000 | 8487 | 24d0 | 0000 |
| 4204500 | 0008 | dd9c | 0010 | 41e8 | 0000 | 2ae7 | 447c | 0000 | 0100 | 0e4f | 4b8c | 0000 | 0000 | 8487 | 24d0 | 0000 | 0008 | dd5c | 0010 | 41e8 | 0000 | 3d67 | 447c | 0000 |
| 4204560 | 0100 | 0e4f | 4b8c | 0000 | 0000 | 8487 | 24d0 | 0000 | 0008 | dd5c | 0010 | 3310 | 4300 | 0000 | 0000 | 8497 | 0008 | b09c | 0010 | 3d54 | 4254 | 0000 | 0000 | 20f7 |
| 4204640 | 447c | 0000 | 0100 | 0e4f | 4b8c | 0000 | 0000 | 8487 | 24d0 | 0000 | 0008 | dd9c | 000c | 41e8 | 0000 | 823f | 447c | 0000 | 0100 | 0e4f | 4b8c | 0000 | 0000 | 8487 |
| 4204720 | 242c | 0000 | 0008 | dd5c | 2954 | 00c0 | 0002 | 438a | 4e1c | 0000 | 0000 | 8397 | 2520 | 46d8 | 4268 | 0000 | 0000 | 5fff | 4254 | 0000 | 0000 | 8357 | 3b4c | 0000 |
| 4205000 | 0008 | dd9c | 0018 | 2ba0 | 0018 | 0058 | 33d8 | 41e8 | 0000 | 834f | 3b4c | 0000 | 0008 | dd9c | 0018 | 3d0c | 4e1c | 0000 | 0000 | 835f | 2ba0 | 0014 | 001a | 42ac |
| 4205060 | 0000 | 84a7 | 0008 | ec1c | 0014 | 247c | 0008 | d13c | 0014 | 2c88 | 003e | 2c58 | 4300 | 0000 | 0000 | 84af | 0008 | ec1c | 0014 | 247c | 0008 | d13c | 0014 | 2c88 |
| 4205140 | 0022 | 2c58 | 329c | 247c | 0019 | 28e0 | 0014 | 455c | 6d50 | 5370 | 4300 | 0000 | 0000 | 84b7 | 0008 | c0fc | 0010 | 41fc | 0000 | 8367 | 4254 | 0000 | 0000 | d357 |
| 4205220 | 2420 | 0000 | 0008 | dd9c | 0018 | f3c8 | 0000 | 0038 | b27c | b66c | 0000 | 123c | 0000 | 1252 | 0018 | f3cc | 0200 | 0db5 | 0500 | 1cdd | 0000 | 6d07 | 0000 | 001b |
| 4205300 | 0000 | 3287 | 00c9 | 6de3 | 0000 | 0433 | 0000 | 315f | 27f0 | 0030 | 0018 | f390 | 4e1c | 0000 | 0000 | 251f | 2520 | 46d8 | 35ec | 3050 | 3b4c | 0000 | 000c | 194c |
| 4205360 | 0010 | 41e8 | 0000 | 831f | 2420 | 0000 | 0008 | dd5c | 2954 | 0034 | 0002 | 438a | 4e1c | 0000 | 0000 | 3cd7 | 57b8 | 4af8 | 0000 | 831f | 55f0 | 4af8 | 0000 | 838f |
| 4205440 | 55f0 | 4af8 | 0000 | 016f | 55f0 | 4af8 | 0000 | 8397 | 5370 | 229c | 0018 | f740 | 0000 | 0038 | b27c | b66c | 0000 | 123d | 0000 | 1253 | 0018 | f744 | 0200 | 0db5 |
| 4205520 | 0500 | 1cdd | 0000 | 6d07 | 0000 | 0013 | 0000 | 3287 | 00c9 | 7003 | 0000 | 0433 | 0000 | 315f | 27f0 | 00c0 | 0018 | f4bc | 4e1c | 0000 | 0000 | 831f | 2520 | 46d8 |
| 4205600 | 37dc | 42ac | 0000 | 831f | 0019 | 2800 | 0018 | 41fc | 0000 | 6d07 | 4254 | 0000 | 0000 | 8327 | 3b4c | 0000 | 0008 | dd9c | 0018 | 33d8 | 37dc | 42ac | 0000 | 839f |
| 4205660 | 000c | 185c | 0018 | 43e4 | 0300 | 7767 | 6d94 | 4af8 | 0000 | 0193 | 4b8c | 0000 | 0000 | 0af3 | 329c | 247c | 0008 | cf7c | 0014 | 43e4 | 0400 | 30bf | 4b8c | 0000 |
| 4205740 | 0000 | 6d07 | 4b9c | 0000 | 0000 | 0193 | 4b8c | 0000 | 0000 | 00a3 | 4b8c | 0000 | 0000 | 7777 | 3ba0 | 0000 | 0016 | 4a94 | 0014 | 3d60 | 37dc | 42ac | 0000 | 7767 |
| 4206020 | 000c | 1dbc | 0010 | 41fc | 0000 | 835f | 4254 | 0000 | 0000 | 8347 | 2420 | 0000 | 0008 | dd9c | 28c4 | 0104 | 0018 | f5c0 | 4e1c | 0000 | 0000 | 838f | 2520 | 43e4 |
| 4206100 | 0100 | 3d4f | 4b8c | 0000 | 0000 | 84c7 | 447c | 0000 | 0100 | 0e4f | 4b8c | 0000 | 0000 | 84bf | 24d0 | 0000 | 000b | 43b0 | 0010 | 4408 | 0200 | 3d5f | 4b8c | 0000 |
| 4206160 | 0000 | 12c3 | 4b8c | 0000 | 0000 | 0283 | 4254 | 0000 | 0000 | 3d5f | 447c | 0000 | 0100 | 0e4f | 4b8c | 0000 | 0000 | 84bf | 24d0 | 0000 | 0008 | dd9c | 0010 | 41e8 |
| 4206240 | 0000 | 2ae7 | 447c | 0000 | 0100 | 0e4f | 4b8c | 0000 | 0000 | 84bf | 24d0 | 0000 | 0008 | dd5c | 0010 | 41e8 | 0000 | 3d67 | 447c | 0000 | 0100 | 0e4f | 4b8c | 0000 |
| 4206320 | 0000 | 84bf | 24d0 | 0000 | 0008 | dd5c | 0010 | 3310 | 4300 | 0000 | 0000 | 84cf | 0008 | b09c | 0010 | 3d54 | 4254 | 0000 | 0000 | 20f7 | 447c | 0000 | 0100 | 0e4f |
| 4206400 | 4b8c | 0000 | 0000 | 84bf | 24d0 | 0000 | 0008 | dd9c | 000c | 41e8 | 0000 | 823f | 447c | 0000 | 0100 | 0e4f | 4b8c | 0000 | 0000 | 84bf | 242c | 0000 | 0008 | dd5c |
| 4206460 | 28c4 | 004c | 0018 | f638 | 4e1c | 0000 | 0000 | 816f | 2520 | 46d8 | 4268 | 0000 | 0000 | 5fff | 4254 | 0000 | 0000 | 8357 | 3b4c | 0000 | 0008 | dd9c | 0010 | 247c |
| 4206540 | 0016 | 481c | 0010 | 41fc | 0000 | 8367 | 4254 | 0000 | 0000 | 8357 | 2420 | 0000 | 0008 | dd9c | 0028 | 5369 | 7a65 | 2065 | 7374 | 696d | 6174 | 696f | 6e20 | 6861 |
| 4206620 | 7320 | 616c | 7265 | 6164 | 7920 | 6265 | 656e | 2064 | 6f6e | 652e | 7e6e | 0065 | 2954 | 0104 | 0002 | 438a | 4e1c | 0000 | 0000 | 8397 | 2520 | 46d8 | 4268 | 0000 |
| 4206700 | 0000 | 5fff | 4254 | 0000 | 0000 | 8357 | 3b4c | 0000 | 0008 | dd9c | 0020 | 2ba0 | 0020 | 009c | 3410 | 001c | 4254 | 0000 | 0000 | 834f | 3b4c | 0000 | 0008 | dd9c |
| 4206760 | 0020 | 3df4 | 001c | 4c70 | 0000 | 835f | 2ba0 | 001c | 005a | 42ac | 0000 | 84d7 | 0008 | ec1c | 001c | 247c | 0008 | d13c | 001c | 32b8 | 24d0 | 0000 | 0014 | 11e8 |
| 4207040 | 001c | 3a4c | 0014 | 1208 | 001c | 3364 | 3bf4 | 0000 | 0015 | ab1c | 001c | 3d48 | 40f4 | 0000 | 0014 | 138c | 0014 | 42ac | 0000 | 84df | 0008 | ec1c | 0014 | 247c |
| 4207120 | 0008 | d13c | 0014 | 2c88 | 003e | 2c58 | 4300 | 0000 | 0000 | 84e7 | 0008 | ec1c | 0014 | 247c | 0008 | d13c | 0014 | 2c88 | 0022 | 2c58 | 329c | 247c | 0019 | 28e0 |
| 4207200 | 0014 | 4550 | 6d50 | 5370 | 4300 | 0000 | 0000 | 84ef | 0008 | c0fc | 0010 | 41fc | 0000 | 8367 | 4254 | 0000 | 0000 | 8357 | 2420 | 0000 | 0008 | dd9c | 0018 | f8d0 |
| 4207260 | 0000 | 00e8 | b27c | b66c | 0000 | 123e | 0000 | 1254 | 0018 | f77c | 0200 | 0db5 | 0500 | 1cdd | 0000 | 8387 | 0000 | 0013 | 0000 | 3287 | 00c9 | 7723 | 0000 | 0433 |
| 4207340 | 0000 | 315f | 0018 | f7b0 | 0000 | 0038 | b27c | b66c | 0000 | 123f | 0000 | 1255 | 0018 | f7b4 | 0200 | 0db5 | 0500 | 1cdd | 0000 | 831f | 0000 | 0003 | 0000 | 3287 |
| 4207420 | 00c9 | 7a03 | 0000 | 0433 | 0000 | 315f | 0018 | f7e8 | 0000 | 0038 | b27c | b66c | 0000 | 1240 | 0000 | 1256 | 0018 | f8d4 | 0200 | 0db5 | 0500 | 1cdd | 0000 | 84f7 |
| 4207500 | 0000 | 0003 | 0000 | 3287 | 00c9 | 7ba3 | 0000 | 0433 | 0000 | 315f | 0018 | f8d0 | 0000 | 0040 | 0018 | b9ec | 0018 | b744 | 0000 | 0000 | 0000 | 0000 | 0000 | 0000 |
| 4207560 | 0000 | 0000 | 0018 | b8b8 | 0000 | 0000 | 0019 | 3034 | 0018 | b888 | 0000 | 0000 | 0000 | 0000 | 0018 | b7d4 | 0000 | 0000 | 2c78 | 00a8 | 0002 | 438a | 2520 | 442c |
| 4207640 | 0200 | 3d5f | 4b8c | 0000 | 0000 | 08c3 | 4b8c | 0000 | 0000 | 1273 | 4268 | 0000 | 0000 | 8507 | 4254 | 0000 | 0000 | 2edf | 447c | 0000 | 0100 | 0e4f | 4b8c | 0000 |
| 4207720 | 0000 | 84ff | 24d0 | 0000 | 0019 | 1f54 | 000c | 4408 | 0200 | 2b67 | 4b8c | 0000 | 0000 | 0203 | 4b8c | 0000 | 0000 | 0003 | 4254 | 0000 | 0000 | 2b7f | 447c | 0000 |
| 4210000 | 0100 | 0e4f | 4b8c | 0000 | 0000 | 84ff | 24d0 | 0000 | 0008 | dd9c | 000c | 41fc | 0000 | 2aa7 | 4254 | 0000 | 0000 | 7657 | 447c | 0000 | 0100 | 0e4f | 4b8c | 0000 |
| 4210060 | 0000 | 84ff | 242c | 0000 | 0008 | dd9c | 0018 | f98c | 0000 | 0070 | b27c | b66c | 0000 | 1241 | 0000 | 1257 | 0018 | f90c | 0200 | 0db5 | 0500 | 1cdd | 0000 | 765f |
| 4210140 | 0000 | 0013 | 0000 | 3287 | 00c9 | 61e3 | 0000 | 0433 | 0000 | 315f | 0018 | f98c | 0000 | 0038 | b27c | b66c | 0000 | 1242 | 0000 | 1258 | 0018 | f990 | 0200 | 0db5 |
| 4210220 | 0500 | 1cdd | 0000 | 7747 | 0000 | 002b | 0000 | 3287 | 00b2 | 53a3 | 0000 | 0433 | 0000 | 315f | 2c78 | 004c | 0002 | 438a | 45b8 | 370c | 001c | 482c | 0018 | 43c0 |
| 4210300 | 0300 | 7667 | 6bc8 | 6c08 | 4b8c | 0000 | 0000 | 0003 | 44a0 | 0000 | 0200 | 774f | 6c48 | 001c | 6b74 | 39a4 | 000b | 43b0 | 0014 | 3858 | 4254 | 0000 | 0000 | 1d17 |
| 4210360 | 2420 | 0000 | 0008 | df5c | 0018 | fc58 | 0000 | 0038 | b27c | b66c | 0000 | 1243 | 0000 | 1259 | 0018 | fc5c | 0200 | 0db5 | 0500 | 1cdd | 0000 | 8517 | 0000 | 0003 |
| 4210440 | 0000 | 3287 | 00c9 | 8023 | 0000 | 0433 | 0000 | 315f | 2c78 | 0294 | 0002 | 438a | 2520 | 247c | 000c | 1c0c | 000c | 247c | 0019 | 2f40 | 000c | 41e8 | 0000 | 5257 |
| 4210520 | 4300 | 0000 | 0000 | 5257 | 000c | 1acc | 000c | 41fc | 0000 | 8167 | 4550 | 4af8 | 0000 | 5257 | 5370 | 42ac | 0000 | 8167 | 000c | 1b9c | 000c | 41fc | 0000 | 83df |
| 4210600 | 4550 | 4af8 | 0000 | 5257 | 5370 | 42ac | 0000 | 83df | 000c | 1b9c | 000c | 41fc | 0000 | 6b37 | 4550 | 4af8 | 0000 | 5257 | 5370 | 42ac | 0000 | 6b37 | 000c | 1b9c |
| 4210660 | 000c | 41fc | 0000 | 847f | 4550 | 4af8 | 0000 | 5257 | 5370 | 42ac | 0000 | 847f | 000c | 1b9c | 000c | 41fc | 0000 | 6d07 | 4550 | 4af8 | 0000 | 5257 | 5370 | 42ac |
| 4210740 | 0000 | 6d07 | 000c | 1b9c | 000c | 41e8 | 0000 | 8167 | 4300 | 0000 | 0000 | 851f | 0008 | cf7c | 000c | 41e8 | 0000 | 83df | 4300 | 0000 | 0000 | 80c7 | 0008 | cf7c |
| 4211020 | 000c | 41e8 | 0000 | 6b37 | 4300 | 0000 | 0000 | 8527 | 0008 | cf7c | 000c | 41e8 | 0000 | 847f | 4300 | 0000 | 0000 | 852f | 0008 | cf7c | 000c | 41e8 | 0000 | 6d07 |
| 4211100 | 4300 | 0000 | 0000 | 8537 | 0008 | cf7c | 000c | 43e4 | 0100 | 83bf | 4b8c | 0000 | 0000 | 853f | 447c | 0000 | 0200 | 0daf | 4b8c | 0000 | 0000 | 3287 | 6bb4 | 247c |

```
4211160  0008 b2bc 000c 4408 0200 3d5f 4b8c 0000 0000 0643 4b8c 0000 0000 0e13 4254 0000 0000 8507 447c 0000 0100 0e4f 4b8c 0000
4211240  0000 8547 24d0 0000 0016 45a8 000c 41e8 0000 2ae7 447c 0000 0100 0e4f 4b8c 0000 0000 8547 24d0 0000 0008 dd5c 000c 41e8
4211320  0000 823f 447c 0000 0100 0e4f 4b8c 0000 0000 8547 24d0 0000 0008 dd5c 000c 4408 0100 0e4f 4b8c 0000 0000 8547 4254 0000
4211400  0000 837f 4300 0000 0000 851f 0008 dd9c 000c 4408 0100 0e4f 4b8c 0000 0000 8547 4254 0000 0000 837f 4300 0000 0000 80c7
4211460  0008 dd9c 000c 4408 0100 0e4f 4b8c 0000 0000 8547 4254 0000 0000 837f 4300 0000 0000 8527 0008 dd9c 000c 4408 0100 0e4f
4211540  4b8c 0000 0000 8547 4254 0000 0000 837f 4300 0000 0000 852f 0008 dd9c 000c 4408 0100 0e4f 4b8c 0000 0000 8547 4254 0000
4211620  0000 837f 4300 0000 0000 8537 0008 dd9c 000c 42ac 0000 854f 0008 ec1c 000c 247c 0008 d13c 000c 41d4 0000 21ef 242c 0000
4211700  0008 d6bc 0018 fce8 0000 0038 b130 b66c 0000 1244 0000 125a 0018 def5 0200 0db5 0500 1cdd 0000 8557 0000 0003 0000 3287
4211760  00c9 8123 0000 0433 0000 315f 2c78 0050 0002 438a 2520 41e8 0000 2ae7 447c 0000 0100 0e4f 4b8c 0000 0000 8547 24d0 0000
4212040  0008 dd5c 000c 41e8 0000 823f 447c 0000 0100 0e4f 4b8c 0000 0000 8547 24d0 0000 0008 dd5c 000c 41d4 0000 21ef 242c 0000
4212120  0008 d6bc 0019 3150 0000 2188 3029 2c20 626c 7565 2c20 3529 2e20 2020 200a 7374 796c 6528 6369 7263 6c65 2c20 6369 7263
4212200  6c65 2830 2c20 302c 2032 3029 2c20 7265 642c 2035 292e 0a73 7479 6c65 286c 696e 652c 206c 696e 6528 302c 2030 2c20 302c
4212260  2030 292c 2067 7265 656e 2c20 3329 2e0a 7374 796c 6528 7465 7874 2862 6f78 292c 2054 6578 742c 2074 6578 7428 5465 7874
4212340  2c20 302c 2030 2c20 6365 6e74 6572 2929 2e0a 7374 796c 6528 7465 7874 2863 6972 636c 6529 2c20 5465 7874 2c20 7465 7874
4212420  2854 6578 742c 2030 2c20 302c 2063 656e 7465 7229 292e 0a73 7479 6c65 2874 6578 7428 7465 7874 292c 2054 6578 742c 2074
4212500  6578 7428 5465 7874 2c20 302c 2030 2c20 6365 6e74 6572 2929 2e0a 0a25 2525 2525 2525 2525 2525 2525 2525 2525 2525 2525
4212560  2525 2525 2525 2525 2525 2525 2525 2525 2525 2525 2525 2525 2525 2525 2525 2525 2525 2525 2525 2525 2525 2525 2525 2525
4212640  2525 2525 2525 2525 250a 0000 0000 0000 0000 0000 0000 0000 0000 0000 0000 0000 0000 0000 0000 0000 0000 0000 0000 0000
4212720  0000 0000 0018 fea8 0000 0040 0000 0000 0000 0000 0000 0000 0019 2444 0019 24a0 0019 24d4 0019 252c 0000 0000 0000 0000
4213000  0019 23c4 0019 22e4 0019 2314 0000 0000 0019 2584 0019 3150 0000 1fc8 2525 2525 2525 2525 2525 2525 250a 2525 2066 696c
4213060  653a 2070 726f 7461 6c6b 5f75 7469 6c73 2e70 6c0a 2525 2525 2525 2525 2525 2525 2525 2525 2525 2525 2525 2525 2525 2525
4213140  2525 2525 2525 2525 2525 2525 2525 2525 2525 2525 2525 2525 2525 2525 2525 2525 2525 2525 2525 2525 2525 2525 2525 2525
4213220  250a 0a6d 6179 6265 5f6e 6577 284e 616d 652c 2054 6572 6d29 203a 2d0a 0976 6172 284e 616d 6529 2020 2020 2d3e 206e 6577
4213300  284e 616d 652c 2054 6572 6d29 0a20 2020 2020 207c 206f 626a 6563 7428 4e61 6d65 2920 2d3e 2074 7275 6520 0a20 2020 2020
4213360  207c 206f 7468 6572 7769 7365 2020 2020 2d3e 206e 6577 284e 616d 652c 2054 6572 6d29 2e09 0a0a 0a00 0000 0000 0000 0000
4213440  0000 0000 0000 0000 0000 0000 0000 0000 0000 0000 0000 0000 0000 0000 0000 0000 0000 0000 0000 0000 0000 0000 0000 0000
*
4232660  0000 0000 0000 0000 0000 0000 0000 0000 0000 0000 0000 0000 0000 0000 0000 0000 0000 0000 0000 0000 0000 0000 0012 0c50
4232740  0100 81af 0000 3287 0000 0004 000a 18f0 0002 438a 0003 0087 0000 0000 0015 aa18 0200 80f7 0000 3287 0000 0008 000a 18f0
4233020  0002 438a 0003 0087 0000 0000 0012 0c70 0100 81b7 0000 3287 0000 0004 000a 18f0 0002 438a 0003 0087 0000 0000 0016 4624
4233100  0400 767f 0000 3287 0000 0010 000a 18f0 0002 438a 0003 0087 0000 0000 0012 6469 7370 6c61 795f 666c 6f77 5f67 7261 7068
4233160  0000 0000 0012 4574 0100 81bf 0000 3287 0000 0004 0018 4024 0018 4024 0001 0087 0000 0000 0012 0ea8 0100 81f7 0000 3287
4233240  0000 0004 0019 2088 0019 2088 0001 0087 0000 0000 0019 1f04 0400 81bf 0000 3287 0000 0010 0019 1fac 0019 1fac 0001 0087
4233320  0000 0000 0019 1f44 0200 81bf 0000 3287 0000 0008 0019 1f84 0019 1f84 0001 0087 0000 0000 2c78 0028 0002 438a 44e8 0000
4233400  0200 3d5f 4b8c 0000 0000 1e53 4b8c 0000 0000 1903 3640 22bc 0019 1f54 2c78 0014 0002 438a 3260 0018 239c 0000 0019 1fd0
4233460  0019 1f64 0500 81bf 0000 3287 0000 0014 0018 4104 0018 4104 0001 0087 0000 0000 000e 6d61 7962 655f 6164 645f 7465 7874
4233540  0000 0000 ffff ffff 0300 81df 0000 3287 0000 000c 0018 45d0 0018 a674 0001 0087 0000 0000 0012 0dd4 0500 81e7 0000 3287
4233620  0000 0014 0018 4460 0018 4460 0001 0087 0000 0000 0015 abd4 0500 81ef 0000 3287 0000 0018 0018 4514 0018 4514 0001 0087
4233700  0000 0000 000f 6765 6e5f 6e6f 6465 5f73 6572 6961 6c00 0000 ffff ffff 0300 81ff 0000 3287 0000 000c 0019 25e0 0019 25e0
4233760  0001 0087 0000 0000 2c78 0018 0002 438a 35c8 41d4 0000 8207 239c 0000 0015 358c 0015 ac44 0300 820f 0000 3287 0000 000c
4234040  0019 2104 0019 2104 0001 0087 0000 0000 0012 10a0 0200 8217 0000 3287 0000 0008 0019 20e0 0019 20e0 0001 0087 0000 0000
4234120  2c78 0024 0002 438a 45c4 4700 3280 247c 0019 1e7c 0018 386c 37f0 3cf4 242c 0000 0019 20b0 2c78 0024 0002 438a 45b8 46ec
4234200  4768 3244 3228 320c 3ba0 0000 0019 1edc 0018 231c 0019 2138 000b 6ebc 0300 2697 0000 3287 0000 000c 0018 47dc 0018 47dc
4234260  0001 0087 0000 0000 0015 ac84 0200 8227 0000 3287 0000 0008 0018 4940 0018 4940 0001 0087 0000 0000 0019 2068 0400 81ff
4234340  0000 3287 0000 0010 0019 2594 0019 2594 0001 0087 0000 0000 000f 636c 6963 6b65 645f 6f6e 5f6e 6f64 6500 0000 0015 ad1c
4234420  0200 8247 0000 3287 0000 0008 0019 21bc 0019 21bc 0001 0087 0000 0000 2c78 0024 0002 438a 3574 2520 3430 3228 320c 247c
4234500  0019 1edc 0010 3cf4 242c 0000 0018 b9dc 0019 696e 6974 5f66 6c6f 775f 6772 6170 685f 696e 7465 726e 616c 7300 0015 add0
4234560  0000 824f 0000 3287 0000 0000 0019 2248 0019 2248 0001 0087 0000 0000 000e 6d61 6b65 5f63 6f6c 6f72 5f6d 6170 0000 0000
4234640  0013 6d61 6b65 5f67 7261 7068 5f65 6c65 6d65 6e74 7300 0000 2c78 0028 0002 438a 2520 43c0 0100 0e4f 4b8c 0000 0000 81d7
4234720  24d0 0000 0019 2280 000c 234c 0019 22a0 0012 11c8 0100 8257 0000 3287 0000 0004 0019 22b0 0018 4bac 0001 0087 0000 0000
4235000  0015 aeac 0000 825f 0000 3287 0000 0000 0018 4e50 0018 4e50 0001 0087 0000 0000 27f0 0014 0018 4bac 2520 247c 0008 d33c
4235060  000c 2eb0 0017 f404 0100 8267 0000 3287 0000 0004 0018 4c14 0018 bdc4 0001 0087 0000 0000 000b 626c 6f63 6b5f 7072 6f74
4235140  6f00 0000 0017 74ac 0500 386f 0000 3287 0000 0014 0019 2324 0019 2324 0001 0087 0000 0000 000b 626c 6f63 6b5f 706f 7075
4235220  7000 0000 2cac 0000 0002 438a 2ca0 0000 0000 001c 0000 0007 0018 4cac 0018 4de4 0002 438a 0019 2374 0001 6e00 0018 4cb8
4235300  0000 0000 0004 626c 7565 0000 000a 666f 7265 6772 6f75 6e64 0018 4d54 0018 4d20 0019 234c 0018 4dbc 0018 4d88 0018 4df0
```

```
4235360  0000 0000 0000 0000 0018 4cec 0019 236d 0018 4d54 0003 6667 3100 0000 0003 6267 3100 0000 000a 6261 636b 6772 6f75 6e64
4235440  0000 0000 000b 6d61 6b65 5f63 6972 636c 6500 0000 000a 6469 7370 6c61 795f 6f6e 0000 0000 0018 e9d0 0018 a168 0019 24a0
4235520  0018 bd20 0015 b144 0300 82af 0000 3287 0000 000c 0019 2464 0018 4f3c 0001 0087 0000 0000 0015 b164 0300 82b7 0000 3287
4235600  0000 000c 0019 24c0 0018 5028 0001 0087 0000 0000 0015 b660 0200 82bf 0000 3287 0000 0008 0019 24f4 0019 24f4 0001 0087
4235660  0000 0000 000a 6765 745f 7374 6174 7573 0019 2584 0018 f39c 0018 f36c 0019 2d20 0019 24e4 27f0 0014 0018 4f3c 2520 247c
4235740  0008 d33c 000c 2eb0 0004 6e73 6577 0000 0015 b714 0300 82c7 0000 3287 0000 000c 0019 253c 0019 253c 0001 0087 0000 0000
4236020  0000 8357 29c8 0000 0019 2638 0018 dfec 0018 eb9c 0018 eb6c 0018 f044 0018 f014 27f0 0014 0018 5028 2520 247c 0008 433c
4236100  000c 2eb0 000b 756e 7072 6f63 6573 7365 6400 26bc 0018 f170 0000 0000 0018 e5a8 0018 b4ac 2c78 0020 0002 438a 3640 43e4
4236160  0200 387f 4b8c 0000 0000 30bf 6bc8 22bc 000b 43b0 000a 7065 7263 656e 7461 6765 0000 0000 0001 7300 0001 7700 000a 7365
4236240  745f 7374 6174 7573 0000 0000 2cac 0000 0002 438a 2ca0 0000 0000 0004 0000 0002 0018 514c 0018 5260 0002 438a 0019 257c
4236320  0019 2604 0002 7570 0000 0000 0004 646f 776e 0000 0004 6c65 6674 0000 0018 526c 0018 5158 0000 85bf b328 0000 0018 c1c8
4236400  0000 c000 2cac 0000 0002 438a 2ca0 0000 0000 000c 0000 0003 0018 53ac 0018 543c 0002 438a 0019 25d0 000d d0e8 0000 0000
4236460  0019 71d0 000f 8400 000f cbc0 0000 0000 0018 5404 0000 0000 0018 53b8 0018 5448 2cac 0000 0002 438a 2ca0 0000 0000 0000
4236540  0000 0001 0018 54c0 0018 5538 0002 438a 0019 2560 0100 30bf 29c8 0000 0018 bd64 0018 54d0 0009 6765 745f 7374 6174 6500
4236620  2b24 2618 0002 438a 0019 2740 2aa8 2624 0019 2620 0018 e0bc 2aa8 2630 0019 262c 0018 e074 0009 7072 6f63 6573 7365 6400
4236700  0009 7365 745f 7374 6174 6500 0008 6765 745f 7369 7a65 0068 0008 7365 745f 7369 7a65 0074 0009 6765 745f 6c61 6265 6c00
4236760  0007 6364 6667 2e70 6c00 268c 0019 2270 0300 5257 0000 3287 0000 000c 0019 26cc 0019 26cc 0001 0086 0000 0000 0019 2f00
4237040  27f0 001c 0018 df18 4e1c 0000 0000 251f 3574 35ec 3050 22bc 000c 194c 2cac 0000 0002 438a 2ca0 0000 0000 003c 0000 000d
4237120  0019 26b0 0018 e0f4 0002 438a 0018 e024 28c4 0020 0019 2710 4e1c 0000 0000 8327 4240 0000 0000 2627 239c 0000 000c 1dbc
4237200  28c4 0020 0018 df74 4e1c 0000 0000 832f 4240 0000 0000 2627 239c 0000 000c 185c 28c4 0020 0019 2790 4e1c 0000 0000 8357
4237260  4240 0000 0000 2f7f 239c 0000 000c 1dbc 28c4 0020 0019 2770 4e1c 0000 0000 8337 4240 0000 0000 3d5f 239c 0000 000c 1dbc
4237340  28c4 0020 0018 dfdc 4e1c 0000 0000 833f 4240 0000 0000 3d5f 239c 0000 000c 185c 28c4 0020 0019 27b0 4e1c 0000 0000 836f
4237420  4240 0000 0000 2f7f 239c 0000 000c 185c 28c4 0020 0019 27d0 4e1c 0000 0000 8347 4240 0000 0000 8377 239c 0000 000c 1dbc
4237500  28c4 0020 0018 e0f4 4e1c 0000 0000 834f 4240 0000 0000 8377 239c 0000 000c 185c 0019 268c 0200 5257 0000 3287 0000 0008
4237560  0019 2810 0018 a388 0001 0086 0000 0000 27f0 0000 0018 a388 2ca0 0000 0000 0000 0000 0001 0018 e160 0018 a398 0002 438a
4237640  0019 2834 0018 e16c 0018 bbe8 0300 9167 0000 3287 0000 000c 0019 2858 0019 2858 0001 0086 0000 0000 2cac 0000 0002 438a
4237720  2ca0 0000 0000 0004 0000 0002 0018 e344 0018 e374 0002 438a 0018 aaa8 2cac 0000 0002 438a 2ca0 0000 0000 000c 0000 0004
4240000  0018 e3d8 0018 e5dc 0002 438a 0018 a058 0016 7668 646c 5f73 6f75 7263 655f 6865 6c70 7769 6e64 6f77 0000 0000 0010 7668
4240060  646c 5f73 6f75 7263 652e 6865 6c70 0000 0015 b8c4 0100 83bf 0000 3287 0000 0004 000a 18f0 000a 18f0 0000 0000 0000 0000
4240140  001c 5648 444c 2041 6e61 6c79 7a65 7220 6e6f 7420 6176 6169 6c61 626c 652e 0000 0025 4361 6e6e 6f74 2061 6e61 6c79 7a65
4240220  2028 6e6f 2056 4944 4c20 736f 7572 6365 2066 696c 6529 2e00 0012 445c 0300 83df 0000 3287 0000 000c 0019 2958 0019 2958
4240300  0001 0086 0000 0000 2cac 0000 0002 438a 2ca0 0000 0000 0004 0000 0002 0018 e764 0018 e794 0002 438a 0018 a160 0019 2938
4240360  0200 83df 0000 3287 0000 0008 0019 299c 0019 299c 0001 0086 0000 0000 2cac 0000 0002 438a 2ca0 0000 0000 000c 0000 0004
4240440  0018 e900 0018 e944 0002 438a 0018 b1a0 0015 666c 6f77 5f67 7261 7068 5f68 656c 7077 696e 646f 7700 0010 4845 4c50 3a20
4240520  666c 6f77 5f67 7261 7068 0000 000f 666c 6f77 5f67 7261 7068 2e68 656c 7000 0000 0012 4469 7370 6c61 7920 636f 6d70 6c65
4240600  7465 642e 0000 0000 000f 436f 6d70 696c 696e 6720 7e61 2e7e 6e00 0000 0016 436f 6d70 696c 6174 696f 6e20 636f 6d70 6c65
4240660  7465 642e 0000 0000 0012 436f 6d70 696c 6174 696f 6e20 6661 696c 6564 0000 0000 001e 7e61 2068 6173 2061 6c72 6561 6479
4240740  2062 6565 6e20 636f 6d70 696c 6564 7e6e 0000 0000 0012 4794 0100 840f 0000 3287 0000 0004 0013 13fc 0013 13fc 0001 0045
4241020  0000 0000 0013 7a90 0300 6b37 0000 3287 0000 000c 0019 2ac4 0019 2ac4 0001 0086 0000 0000 2cac 0000 0002 438a 2ca0 0000
4241100  0000 0004 0000 0002 0018 eb60 0018 eb90 0002 438a 0019 24b0 0019 2aa4 0200 6b37 0000 3287 0000 0008 0019 2b08 0019 2b08
4241160  0001 0086 0000 0000 2cac 0000 0002 438a 2ca0 0000 0000 000c 0000 0004 0018 ebfc 0018 ee20 0002 438a 0018 b494 0013 636c
4241240  7573 7465 7273 5f68 656c 7077 696e 646f 7700 0000 000e 4845 4c50 3a20 636c 7573 7465 7273 0000 0000 0018 4361 6e6e 6f74
4241320  2064 6973 706c 6179 2063 6c75 7374 6572 732e 0000 28c4 0024 0018 ee20 4e1c 0000 0000 816f 2520 42ac 0000 8447 0008 ec1c
4241400  000c 234c 0008 d13c 0016 436c 7573 7465 7269 6e67 206f 7065 7261 7469 6f6e 732e 0000 0000 001b 2020 2020 2043 6f6d 7075
4241460  7461 7469 6f6e 2063 6f6d 706c 6574 6564 2e00 0000 0015 436c 7573 7465 7269 6e67 2063 6f6d 706c 6574 6564 2e00 001a 4361
4241540  6e6e 6f74 2063 6c75 7374 6572 2066 6c6f 7720 6772 6170 682e 0000 0000 0010 d024 0300 847f 0000 3287 0000 000c 0019 2c4c
4241620  0019 2c4c 0001 0086 0000 0000 000b 5ee0 0200 765f 0000 3287 0000 0008 0019 2fa0 0019 2fa0 0001 0086 0000 0000 2cac 0000
4241700  0002 438a 2ca0 0000 0000 0004 0000 0002 0018 f008 0018 f038 0002 438a 0019 24b8 0019 2c0c 0200 847f 0000 3287 0000 0008
4241760  0019 2c90 0019 2c90 0001 0086 0000 0000 2cac 0000 0002 438a 2ca0 0000 0000 000c 0000 0004 0018 f0a4 0018 f268 0002 438a
4242040  0018 b0d8 0015 7061 7274 6974 696f 6e73 5f68 656c 7077 696e 646f 7700 0010 4845 4c50 3a20 7061 7274 6974 696f 6e73 0000
4242120  000f 7061 7274 6974 696f 6e73 2e68 656c 7000 0000 001a 4361 6e6e 6f74 2064 6973 706c 6179 2070 6172 7469 7469 6f6e 732e
4242200  0000 0000 28c4 0024 0018 f268 4e1c 0000 0000 816f 2520 42ac 0000 849f 0008 ec1c 000c 234c 0008 d13c 0024 5061 7274 6974
4242260  696f 6e69 6e67 3a20 6375 7272 656e 746c 7920 756e 6176 6169 6c61 626c 652e 0000 0022 4361 6e6e 6f74 2070 6172 7469 7469
4242340  6f6e 2056 4844 4c20 6465 7363 7269 7074 696f 6e2e 0000 0000 0021 7e61 2068 6173 2061 6c72 6561 6479 2062 6565 6e20 7061
4242420  7274 6974 696f 6e65 647e 6e00 0011 5458 0300 6d07 0000 3287 0000 000c 0019 2dcc 0019 2dcc 0001 0086 0000 0000 2cac 0000
```

```
4242500 0002 438a 2ca0 0000 0000 0004 0000 0002 0018 f360 0018 f390 0002 438a 0019 2454 0019 23ac 0200 6d07 0000 3287 0000 0008
4242560 0019 2e10 0019 2e10 0001 0086 0000 0000 2cac 0000 0002 438a 2ca0 0000 0000 000c 0000 0004 0018 f3fc 0018 f638 0002 438a
4242640 0018 b634 0014 6573 7469 6d61 746f 725f 6865 6c70 7769 6e64 6f77 0000 000f 4845 4c50 3a20 6573 7469 6d61 746f 7200 0000
4242720 000e 6573 7469 6d61 746f 722e 6865 6c70 0000 0000 001c 2020 2020 2045 7870 6c6f 7269 6e67 2064 6573 6967 6e20 7370 6163
4243000 652e 0000 0015 4573 7469 6d61 7469 6f6e 2063 6f6d 706c 6574 6564 2e00 0022 4361 6e6e 6f74 2065 7374 696d 6174 6520 7369
4243060 7a65 206f 6620 6465 7369 676e 2873 292e 0000 0000 0012 3b5c 0200 8387 0000 3287 0000 0008 0019 2f0c 0019 2f0c 0001 0086
4243140 0000 0000 2c78 0018 0002 438a 5d10 0000 0100 0e4f 671c 22bc 0008 dd5c 2cac 0000 0002 438a 2ca0 0000 0000 0000 0000 0001
4243220 0019 2ef4 0019 2ef4 0002 438a 0019 26ac 0012 35e0 0000 831f 0000 3287 0000 0000 0018 b6c0 0018 b6c0 0001 0086 0000 0000
4243300 0011 6469 7370 6c61 795f 746f 705f 6c65 7665 6c00 0012 75b0 0000 84f7 0000 3287 0000 0000 0018 f824 0018 f824 0001 0086
4243360 0000 0000 0016 6c65 6674 2062 7574 746f 5e20 636c 6963 6b65 6420 6f6e 0000 0000 2c78 0028 0002 438a 2520 43c0 0200 0abf
4243440 4b8c 0000 0000 850f 6b88 247c 0008 ec1c 000c 234c 0008 d13c 0004 7061 7274 0000 0003 7069 6300 0000 0019 546f 6f6c 2069
4243520 6e76 6f6b 6564 2073 7563 6365 7373 6675 6c6c 7900 0012 7704 0000 8517 0000 3287 0000 0000 0018 f9c0 0018 f9c0 0001 0086
4243600 0000 0000 000a e784 0000 8557 0000 3287 0000 0000 0018 fc8c 0018 fc8c 0001 0086 0000 0000 000a 6f62 6a65 6374 732e 706c
4243660 0000 0000 0005 6269 7431 3600 0019 2584 0016 1db4 000e 6c69 6e6b 696e 675f 636c 6175 7365 0000 0000 000e 7361 6d65 5f61
4243740 7267 756d 656e 7473 0019 3054 0019 9584 0008 706f 7274 5f6d 6170 00dc 0008 7e70 203d 3e20 7e70 0080 0008 203a 207e 7020
4244020 7e70 008c b464 30cc 0018 c19c 0000 0000 0006 293a 207e 703b 0000 0000 0007 287e 7020 7e70 2900 0000 0008 7e2a 7c2d 2d20
4244100 7e70 0098 0000 0000 0000 000c 54f8 228c 0000 002c 0019 7370 b27c b66c 0000 12b8 7fff ffff 0018 c100 0200 0db5 0200 2f35
4244160 0000 858f 0000 0453 0000 315f 0000 002c 0019 739c b27c b66c 0000 12ee 7fff ffff 0018 bfb0 0200 0db5 0200 224d 0000 858f
4244240 0000 3287 0000 315f 27f0 0014 0019 e128 4e1c 0000 0000 0007 54a8 228c 0019 336c 0000 01e0 b27c b66c 0000 12ba 0000 12ed
4244320 000a d16d 0200 0db5 0200 270d 0000 858f 0000 3287 0000 315f 0019 31b4 0000 0038 b27c b66c 0000 12bb 0000 12ef 0019 31e4
4244400 0200 0db5 0500 1cdd 0000 76ef 0000 000b 0000 3287 00cc f883 0000 0453 0000 315f 0019 31e0 0000 002c b4f0 b4e4 0000 12ba
4244460 7fff ffff 0008 b0dd 0000 0000 0000 0000 0019 4b28 0002 438a 0019 d7cc 0019 3254 0000 0038 b27c b66c 0000 12bc 0000 12f0
4244540 0019 3258 0200 0db5 0500 1cdd 0000 76ef 0000 0013 0000 3287 00b2 3ba3 0000 0453 0000 315f 0019 3254 0000 003c 45b8 3574
4244620 332c 247c 0019 c1e8 0014 42ac 0000 8567 0019 94c8 0014 3d30 3b4c 0000 0008 d65c 000c 41d4 0000 8567 242c 0000 0019 963c
4244700 0019 328c 0000 0038 b27c b66c 0000 12bd 0000 12f1 0019 32c4 0200 0db5 0500 1cdd 0000 8857 0000 0013 0000 3287 00ce 0f43
4244760 0000 0453 0000 315f 0019 32c0 0000 0034 45b8 46ec 37dc 42ac 0000 5eef 0011 ffa0 0014 39f8 0019 c220 0010 2ecc 37dc 41d4
4245040 0000 5eef 242c 0000 0011 ffe4 0019 32f8 0000 0038 b27c b66c 0000 12be 0000 12f2 0019 3370 0200 0db5 0500 1cdd 0000 885f
4245120 0000 000b 0000 3287 00ce 1103 0000 0453 0000 315f 0019 336c 0000 0038 56f8 671c 55f0 6854 55f0 6a00 55f0 69b0 5370 247c
4245200 0019 c25c 0019 3a4c 0019 c27c 0014 39f8 0019 c29c 0010 2340 0019 c2bc 0038 5254 2061 7263 6869 7465 6374 7572 6520 6765
4245260 6e65 7261 7465 6420 6672 6f6d 2056 4844 4c20 6265 6861 7669 6f72 2064 6573 6372 6970 7469 6f6e 0062 0019 3ab0 0000 0728
4245340 b27c b66c 0000 12bf 0000 12f3 0019 33d4 0200 0db5 0500 1cdd 0000 8867 0000 000b 0000 3287 00ce 12e3 0000 0453 0000 315f
4245420 0019 33d0 0000 002c 5d10 0000 0200 06f7 6840 4af8 0000 8887 3280 247c 0012 73ec 0014 37f0 3cf4 234c 0012 bc4c 0019 3408
4245500 0000 0038 b27c b66c 0000 12c0 0000 12f4 0019 344c 0200 0db5 0500 1cdd 0000 886f 0000 000b 0000 3287 00ce 13e3 0000 0453
4245560 0000 315f 0019 3448 0000 0040 56f8 6044 5d10 0000 0200 59a7 4b8c 0000 0000 888f 55f0 671c 5370 5758 6750 5370 5d7c 0000
4245640 0100 57ff 4b8c 0000 0000 888f 239c 0000 0019 c348 0019 3480 0000 0038 b27c b66c 0000 12c1 0000 12f5 0019 34b0 0200 0db5
4245720 0500 1cdd 0000 8997 0000 000b 0000 3287 00ce 1a43 0000 0453 0000 315f 0019 34ac 0000 002c 5d10 0000 0300 57c7 4b8c 0000
4246000 0000 889f 4b8c 0000 0000 88a7 4b8c 0000 0000 88af 228c 2525 0019 34e4 0000 0038 b27c b66c 0000 12c2 0000 12f6 0019 3608
4246060 0200 0db5 0500 1cdd 0000 8877 0000 000b 0000 3287 00ce 14e3 0000 0453 0000 315f 0019 3604 0000 0120 5d10 0000 0200 599f
4246140 4b8c 0000 0000 30b7 5a18 0000 0100 581f 55f0 6160 5d7c 0000 0300 5337 4b8c 0000 0000 5567 4b8c 0000 0000 24c7 4b8c 0000
4246220 0000 88a7 56f8 6160 5d7c 0000 0300 5337 4b8c 0000 0000 1c77 4b8c 0000 0000 24c7 4b8c 0000 0000 88a7 56f8 6160 5d7c 0000
4246300 0300 5337 4b8c 0000 0000 88b7 4b8c 0000 0000 24c7 4b8c 0000 0000 88a7 56f8 6160 5d7c 0000 0300 5337 4b8c 0000 0000 88bf
4246360 4b8c 0000 0000 24c7 4b8c 0000 0000 88a7 56f8 6160 5d7c 0000 0300 5337 4b8c 0000 0000 88c7 4b8c 0000 0000 24c7 4b8c 0000
4246440 0000 88a7 56f8 6160 5d7c 0000 0300 5337 4b8c 0000 0000 88cf 4b8c 0000 0000 24c7 4b8c 0000 0000 88d7 56f8 671c 5370 5aec
4246520 0300 5337 4b8c 0000 0000 88df 4b8c 0000 0000 5327 4b8c 0000 0000 88a7 228c 6e28 0019 363c 0000 0038 b27c b66c 0000 12c3
4246600 0000 12f7 0019 366c 0200 0db5 0500 1cdd 0000 887f 0000 000b 0000 3287 00ce 15e3 0000 0453 0000 315f 0019 3668 0000 002c
4246660 5d10 0000 0400 5237 6044 6840 69b0 247c 0019 c46c 0014 39f8 0019 c48c 0010 2340 0019 c4ac 0019 36a0 0000 0038 b27c b66c
4246740 0000 12c4 0000 12f8 0019 372c 0200 0db5 0500 1cdd 0000 88e7 0000 0013 0000 3287 00ce 2363 0000 0453 0000 315f 0019 36cc
4247020 0000 002c 56f8 671c 55f0 6840 55f0 69b0 5370 247c 0019 c980 0014 39f8 0019 c9a0 0010 2340 0019 c9c0 0019 36e0 0000 0014
4247100 4e1c 0000 0000 0007 54f8 228c 0019 3728 0000 0048 2520 46ec 4e1c 0000 0000 88ff 32d4 247c 0012 747c 001c 3348 4108 0000
4247160 0012 bdf0 0018 3d3c 3280 247c 0012 bbcc 0014 39a4 0012 73ec 0014 37f0 3cf4 234c 0012 bc4c 0019 3760 0000 0038 b27c b66c
4247240 0000 12c5 0000 12f9 0019 3790 0200 0db5 0500 1cdd 0000 88ef 0000 000b 0000 3287 00ce 2463 0000 0453 0000 315f 0019 378c
4247320 0000 002c 56f8 671c 55f0 6840 55f0 69b0 5370 247c 0019 c328 0014 39f8 0019 c534 0010 2340 0019 c554 0019 37c4 0000 0038
4247400 b27c b66c 0000 12c6 0000 12fa 0019 3800 0200 0db5 0500 1cdd 0000 88f7 0000 000b 0000 3287 00ce 2563 0000 0453 0000 315f
4247460 0019 37fc 0000 0038 56f8 671c 55f0 6854 55f0 6a00 55f0 69b0 5370 247c 0019 c630 0018 3a4c 0019 c650 0014 39f8 0019 c670
4247540 0010 2340 0019 c690 0019 386c 0000 0070 b27c b66c 0000 12c7 0000 12fb 0019 3838 0200 0db5 0500 1cdd 0000 8907 0000 000b
```

| | | | | | | | | | | | | | | | | | | | | | | | | |
|---|---|---|---|---|---|---|---|---|---|---|---|---|---|---|---|---|---|---|---|---|---|---|---|---|
| 4247620 | 0000 | 3287 | 00ce | 1943 | 0000 | 0453 | 0000 | 315f | 0019 | 38dc | 0000 | 0038 | b27c | b66c | 0000 | 12c8 | 0000 | 12fc | 0019 | 38e0 | 0200 | 0db5 | 0500 | 1cdd |
| 4247700 | 0000 | 893f | 0000 | 000b | 0000 | 3287 | 00ce | 37c3 | 0000 | 0453 | 0000 | 315f | 0019 | 38dc | 0000 | 0070 | 5d10 | 0000 | 0300 | 57af | 4b8c | 0000 | 0000 | 86bf |
| 4247760 | 4b8c | 0000 | 0000 | 8947 | 55f0 | 4af8 | 0000 | 894f | 6840 | 3310 | 44c4 | 0000 | 0200 | 0ad7 | 4b8c | 0000 | 0000 | 6317 | 4b8c | 0000 | 0000 | 001b | 447c | 0000 |
| 4250040 | 0100 | 61bf | 6bf4 | 247c | 0012 | ec88 | 0014 | 38c0 | 4260 | 0000 | 0000 | 2f7f | 3d24 | 41d4 | 0000 | 000b | 242c | 0000 | 0019 | c770 | 0019 | 3914 | 0000 | 0038 |
| 4250120 | b27c | b66c | 0000 | 12c9 | 0000 | 12fd | 0019 | 3954 | 0200 | 0db5 | 0500 | 1cdd | 0000 | 890f | 0000 | 000b | 0000 | 3287 | 00ce | 29a3 | 0000 | 0453 | 0000 | 315f |
| 4250200 | 0019 | 3950 | 0000 | 003c | 45c4 | 3364 | 4300 | 0000 | 0000 | 5eef | 0012 | 11f8 | 001c | 3348 | 4108 | 0000 | 0019 | c7f4 | 0018 | 2ecc | 3310 | 408c | 000d | d574 |
| 4250260 | 0014 | 37f0 | 3cf4 | 234c | 0019 | c814 | 0019 | 3988 | 0000 | 0038 | b27c | b66c | 0000 | 12ca | 0000 | 12fe | 0019 | 39c4 | 0200 | 0db5 | 0500 | 1cdd | 0000 | 8967 |
| 4250340 | 0000 | 0013 | 0000 | 3287 | 00ce | 40a3 | 0000 | 0453 | 0000 | 315f | 0019 | 39c0 | 0000 | 0038 | 56f8 | 671c | 682c | 5758 | 6750 | 6a00 | 5d7c | 0000 | 0200 | 57e7 |
| 4250420 | 6b74 | 58e0 | 0100 | 591f | 6750 | 247c | 0019 | c888 | 0014 | 2ecc | 2410 | 0000 | 0019 | c814 | 0019 | 3a30 | 0000 | 0070 | b27c | b66c | 0000 | 12cb | 0000 | 12ff |
| 4250500 | 0019 | 39fc | 0200 | 0db5 | 0500 | 1cdd | 0000 | 895f | 0000 | 0013 | 0000 | 3287 | 00ce | 3fa3 | 0000 | 0453 | 0000 | 315f | 0019 | 3a5c | 0000 | 0038 | b27c | b66c |
| 4250560 | 0000 | 12cc | 0000 | 1300 | 0019 | 3ab4 | 0200 | 0db5 | 0500 | 1cdd | 0000 | 8917 | 0000 | 000b | 0000 | 3287 | 00ce | 2aa3 | 0000 | 0453 | 0000 | 315f | 0019 | 3a5c |
| 4250640 | 0000 | 002c | 3690 | 2520 | 46ec | 4769 | 4550 | 69b0 | 5370 | 4538 | 6c08 | 5370 | 24d0 | 0000 | 000b | 5ef0 | 0018 | 231c | 0019 | cbdc | 0019 | 3ab0 | 0000 | 0038 |
| 4250720 | b27c | b66c | 0000 | 12e1 | 0000 | 1315 | 0019 | 4688 | 0200 | 0db5 | 0500 | 1cdd | 0000 | 8a27 | 0000 | 0013 | 0000 | 3287 | 00ce | 8d03 | 0000 | 0453 | 0000 | 315f |
| 4251000 | 0016 | 636f | 6d70 | 6f6e | 656e | 745f | 706f | 7274 | 5f73 | 6967 | 6e61 | 6c73 | 0000 | 0000 | 0019 | 5a3c | 0000 | 16f8 | b27c | b66c | 0000 | 12cd | 0000 | 1301 |
| 4251060 | 0019 | 3b1c | 0200 | 0db5 | 0500 | 1cdd | 0000 | 896f | 0000 | 000b | 0000 | 3287 | 00ce | 4c03 | 0000 | 0453 | 0000 | 315f | 0019 | 3b18 | 0000 | 0030 | 45c4 | 3348 |
| 4251140 | 4300 | 0000 | 0000 | 5eef | 0012 | 11f8 | 0018 | 3310 | 40f4 | 0000 | 0019 | c7f4 | 0014 | 37f0 | 3cf4 | 234c | 0019 | ca18 | 0019 | 3b88 | 0000 | 0070 | b27c | b66c |
| 4251220 | 0000 | 12ce | 0000 | 1302 | 0019 | 3b54 | 0200 | 0db5 | 0500 | 1cdd | 0000 | 896f | 0000 | 0013 | 0000 | 3287 | 00ce | 50c3 | 0000 | 0453 | 0000 | 315f | 0019 | 3bcc |
| 4251300 | 0050 | 0038 | b27c | b66c | 0000 | 12cf | 0000 | 1303 | 0019 | 3bd0 | 0200 | 0db5 | 0500 | 1cdd | 0000 | 896f | 0000 | 001b | 0000 | 3287 | 00ce | 5283 | 0000 | 0453 |
| 4251360 | 0000 | 315f | 0019 | 3bcc | 0000 | 0044 | 56f8 | 671c | 682c | 4700 | 57b8 | 6af0 | 001c | 6a00 | 3364 | 247c | 0019 | c888 | 0020 | 2ecc | 3894 | 001c | 3804 | 40a0 |
| 4251440 | 0019 | cab8 | 0018 | aa50 | aaf0 | 0001 | ac4c | 3858 | 2420 | 0000 | 0019 | ca50 | 0019 | 3c04 | 0000 | 0038 | b27c | b66c | 0000 | 12d0 | 0000 | 1304 | 0019 | 3c58 |
| 4251520 | 0200 | 0db5 | 0500 | 1cdd | 0000 | 8987 | 0000 | 001b | 0000 | 3287 | 00ce | 55c3 | 0000 | 0453 | 0000 | 315f | 0019 | 3c54 | 0000 | 0050 | 56f8 | 671c | 682c | 5aec |
| 4251600 | 0300 | 5337 | 67b8 | 5fa0 | 671c | 46ec | 57b8 | 6750 | 6a50 | 5b58 | 0200 | 57d7 | 6750 | 6b74 | 4538 | 6c34 | 5370 | 4568 | 6150 | 6b74 | 4538 | 4af8 | 0000 | 898f |
| 4251660 | 6bf4 | 247c | 0015 | 366c | 0018 | 231c | 0019 | cab8 | 0019 | 3c8c | 0000 | 0038 | b27c | b66c | 0000 | 12d1 | 0000 | 1305 | 0019 | 3cd8 | 0200 | 0db5 | 0500 | 1cdd |
| 4251740 | 0000 | 8977 | 0000 | 000b | 0000 | 3287 | 00ce | 4d03 | 0000 | 0453 | 0000 | 315f | 0019 | 3cd4 | 0000 | 0048 | 45c4 | 33d8 | 44e8 | 0000 | 0300 | 5357 | 5f8c | 671c |
| 4252020 | 44a0 | 0000 | 0200 | 0daf | 4b9c | 0000 | 0000 | 3287 | 6c34 | 247c | 0008 | c03c | 0018 | 3310 | 40f4 | 0000 | 000d | d574 | 0014 | 37f0 | 3cf4 | 234c | 0019 | cb60 |
| 4252100 | 0019 | 3d0c | 0000 | 0038 | b27c | b66c | 0000 | 12d2 | 0000 | 1306 | 0019 | 3d9c | 0200 | 0db5 | 0500 | 1cdd | 0000 | 8997 | 0000 | 0013 | 0000 | 3287 | 00ce | 5b03 |
| 4252160 | 0000 | 0453 | 0000 | 315f | 0019 | 3d98 | 0000 | 008c | 56f8 | 687c | 0020 | 69b0 | 5758 | 6160 | 5d7c | 0000 | 0200 | 57d7 | 6e58 | 0020 | 6aa0 | 56f8 | 671c | 6a00 |
| 4252240 | 5d10 | 0000 | 0100 | 87bf | 5a18 | 0000 | 0100 | 269f | 6784 | 43c0 | 0300 | 5357 | 5fa0 | 6af0 | 001c | 6e58 | 0020 | 43e4 | 0200 | 0daf | 4b8c | 0000 | 0000 | 3287 |
| 4252320 | 6b74 | 3c9c | 0000 | 001c | 0008 | c03c | 0024 | 3894 | 0020 | 382c | 001c | 32b8 | 24d0 | 0000 | 0019 | cbdc | 001c | 2ecc | 3818 | 408c | 0019 | cbfc | 0014 | 2330 |
| 4252400 | 0019 | cb60 | 0019 | 3dd0 | 0000 | 0038 | b27c | b66c | 0000 | 12d3 | 0000 | 1307 | 0019 | 3e7c | 0200 | 0db5 | 0500 | 1cdd | 0000 | 899f | 0000 | 0013 | 0000 | 3287 |
| 4252460 | 00ce | 5fe3 | 0000 | 0453 | 0000 | 315f | 0019 | 3e78 | 0000 | 00a8 | 45d0 | 46d8 | 2e7c | ada8 | 2ba0 | 0020 | 0038 | 3a4c | 0012 | 07d8 | 0020 | aa34 | 2e98 | 3804 |
| 4252540 | 32f0 | 001c | 24d0 | 0000 | 0012 | 0acc | 0020 | 3c9c | 0000 | 001c | 0012 | 73cc | 0020 | 37dc | 3df4 | 001c | 242c | 0000 | 0012 | 42d4 | 2c30 | 002e | 3bf4 | 0000 |
| 4252620 | 0012 | 07f8 | 001c | aa34 | 2e98 | 3804 | 3284 | 247c | 0012 | 0e80 | 001c | 3aa0 | 0012 | 73cc | 001c | 37dc | 3d18 | 234c | 0012 | 4ae4 | 2c30 | 001c | 3bf4 | 0000 |
| 4252700 | 0012 | 5080 | 0014 | aa34 | 2e98 | 3774 | 4e1c | 0000 | 0000 | 88d7 | 723c | 2c58 | 3774 | 4c70 | 0000 | 88d7 | 723c | 292c | 0019 | 3eb0 | 0000 | 0038 | b27c | b66c |
| 4252760 | 0000 | 12d4 | 0000 | 1308 | 0019 | 3ee0 | 0200 | 0db5 | 0500 | 1cdd | 0000 | 897f | 0000 | 000b | 0000 | 3287 | 00ce | 4e03 | 0000 | 0453 | 0000 | 315f | 0019 | 3edc |
| 4253040 | 0000 | 002c | 5d10 | 0000 | 0200 | 57d7 | 671c | 4af8 | 0000 | 8947 | 56f8 | 4af8 | 0000 | 2f7f | 55f0 | 4af8 | 0000 | 89a7 | 5370 | 228c | 0019 | 3f14 | 0000 | 0038 |
| 4253120 | b27c | b66c | 0000 | 12d5 | 0000 | 1309 | 0019 | 3f68 | 0200 | 0db5 | 0500 | 1cdd | 0000 | 891f | 0000 | 000b | 0000 | 3287 | 00ce | 3183 | 0000 | 0453 | 0000 | 315f |
| 4253200 | 0019 | 3f64 | 0000 | 0050 | 5d10 | 0000 | 0500 | 582f | 671c | 5fa0 | 5370 | 5370 | 6840 | 5aec | 0100 | 2627 | 4b8c | 0000 | 0000 | 89af | 3348 | 42ac | 0000 | 5eef |
| 4253260 | 0012 | 11f8 | 0018 | 3310 | 40f4 | 0000 | 0019 | c7f4 | 0014 | 2ecc | 37f0 | 3cf4 | 242c | 0000 | 0019 | cca8 | 0019 | 3fd4 | 0000 | 0070 | b27c | b66c | 0000 | 12d6 |
| 4253340 | 0000 | 130a | 0019 | 3fa0 | 0200 | 0db5 | 0500 | 1cdd | 0000 | 89b7 | 0000 | 0013 | 0000 | 3287 | 00ce | 6543 | 0000 | 0453 | 0000 | 315f | 0019 | 4058 | 0000 | 0038 |
| 4253420 | b27c | b66c | 0000 | 12d7 | 0000 | 130b | 0019 | 405c | 0200 | 0db5 | 0500 | 1cdd | 0000 | 89b7 | 0000 | 001b | 0000 | 3287 | 00ce | 68c3 | 0000 | 0453 | 0000 | 315f |
| 4253500 | 0019 | 4058 | 0000 | 0084 | 56f8 | 671c | 682c | 4700 | 57b8 | 6750 | 6a00 | 5b58 | 0300 | 877f | 6784 | 6b74 | 6750 | 5bc4 | 0100 | 2627 | 6af0 | 001c | 5d7c | 0000 |
| 4253560 | 0100 | 878f | 6af0 | 0020 | 3364 | 247c | 0019 | c888 | 0024 | 2ecc | 382c | 001c | 4568 | 6d94 | 5370 | 4538 | 4b8c | 0000 | 0000 | 898f | 6bf4 | 247c | 0015 | 366c |
| 4253640 | 0024 | 3894 | 0020 | 382c | 001c | 40a0 | 0019 | cd98 | 0018 | aa50 | aaf0 | 0001 | ac4c | 3858 | 2420 | 0000 | 0019 | cd18 | 0019 | 4090 | 0000 | 0038 | b27c | b66c |
| 4253720 | 0000 | 12d8 | 0000 | 130c | 0019 | 40dc | 0200 | 0db5 | 0500 | 1cdd | 0000 | 89bf | 0000 | 001b | 0000 | 3287 | 00ce | 6cc3 | 0000 | 0453 | 0000 | 315f | 0019 | 40d8 |
| 4254000 | 0000 | 0048 | 56f8 | 671c | 682c | 5aec | 0300 | 5337 | 671c | 5f8c | 46ec | 57b8 | 6750 | 6a50 | 5d7c | 0000 | 0200 | 879f | 6b74 | 6750 | 4568 | 6b74 | 5370 | 4538 |
| 4254060 | 6d50 | 6bf4 | 24d0 | 0000 | 0015 | 366c | 0018 | 231c | 0019 | cd98 | 0019 | 4110 | 0000 | 0038 | b27c | b66c | 0000 | 12d9 | 0000 | 130d | 0019 | 4170 | 0200 | 0db5 |
| 4254140 | 0500 | 1cdd | 0000 | 8927 | 0000 | 000b | 0000 | 3287 | 00ce | 3283 | 0000 | 0453 | 0000 | 315f | 0019 | 416c | 0000 | 005c | 5d10 | 0000 | 0400 | 58e7 | 6750 | 5fa0 |
| 4254220 | 5370 | 671c | 5d7c | 0000 | 0100 | 2627 | 4b8c | 0000 | 0000 | 8357 | 56f8 | 6160 | 5d7c | 0000 | 0100 | 87b7 | 4b8c | 0000 | 0000 | 88cf | 56f8 | 671c | 5370 | 5aec |
| 4254300 | 0200 | 8667 | 4b8c | 0000 | 0000 | 2f7f | 4b8c | 0000 | 0000 | 89a7 | 228c | 2525 | 0019 | 41a4 | 0000 | 0038 | b27c | b66c | 0000 | 12da | 0000 | 130e | 0019 | 423c |
| 4254360 | 0200 | 0db5 | 0500 | 1cdd | 0000 | 892f | 0000 | 000b | 0000 | 3287 | 00ce | 3383 | 0000 | 0453 | 0000 | 315f | 0019 | 4238 | 0000 | 0094 | 5d10 | 0000 | 0400 | 58e7 |
| 4254440 | 6750 | 5fa0 | 5370 | 671c | 5d7c | 0000 | 0100 | 2627 | 4b8c | 0000 | 0000 | 89c7 | 56f8 | 671c | 6840 | 5aec | 0100 | 87b7 | 4b8c | 0000 | 0000 | 88cf | 320c | 42ac |
| 4254520 | 0000 | 5eef | 0012 | 11f8 | 0018 | 33d8 | 320c | 442c | 0200 | 0ad7 | 4b8c | 0000 | 0000 | 6317 | 4b8c | 0000 | 0000 | 001b | 447c | 0000 | 0100 | 61bf | 6c34 | 247c |
| 4254600 | 0019 | ce94 | 0018 | 3430 | 3d6c | 320c | 4300 | 0000 | 0000 | 6947 | 0013 | 380c | 0014 | 37f0 | 3cf4 | 234c | 0019 | ceb4 | 0019 | 4270 | 0000 | 0038 | b27c | b66c |
| 4254660 | 0000 | 12db | 0000 | 130f | 0019 | 42dc | 0200 | 0db5 | 0500 | 1cdd | 0000 | 89d7 | 0000 | 0013 | 0000 | 3287 | 00ce | 75a3 | 0000 | 0453 | 0000 | 315f | 0019 | 42d8 |

```
4254740 0000 0068 45b8 5758 671c 5370 5d10 0000 0200 583f 4b8c 0000 0000 2f7f 55f0 6044 5d10 0000 0200 53c7 4b8c 0000 0000 894f
4255020 55f0 671c 55f0 6a50 5370 5758 6a00 5370 24d0 0000 0019 cf3c 0018 3a4c 0019 cf5c 0014 3858 4254 0000 0000 000b 2420 0000
4255100 0019 cf7c 0019 4310 0000 0038 b27c b66c 0000 12dc 0000 1310 0019 43ac 0200 0db5 0500 1cdd 0000 89df 0000 000b 0000 3287
4255160 00ce 79e3 0000 0453 0000 315f 0019 43a8 0000 0098 56f8 6160 5d7c 0000 0200 8667 4b8c 0000 0000 89ef 4b8c 0000 0000 5567
4255240 56f8 6160 5d7c 0000 0200 8667 4b8c 0000 0000 89f7 4b8c 0000 0000 1c77 56f8 6160 5d7c 0000 0200 8667 4b8c 0000 0000 89ff
4255320 4b8c 0000 0000 88b7 56f8 6160 5d7c 0000 0200 8667 4b8c 0000 0000 8a07 4b8c 0000 0000 88bf 56f8 671c 5370 5aec 0200 8667
4255400 4b8c 0000 0000 8a0f 4b8c 0000 0000 88c7 228c 6765 0019 4418 0000 0070 b27c b66c 0000 12dd 0000 1311 0019 43e4 0200 0db5
4255460 0500 1cdd 0000 89e7 0000 000b 0000 3287 00ce 7ae3 0000 0453 0000 315f 0019 4470 0000 0038 b27c b66c 0000 12de 0000 1312
4255540 0019 4474 0200 0db5 0500 1cdd 0000 89d7 0000 001b 0000 3287 00ce 7be3 0000 0453 0000 315f 0019 4470 0000 0058 56f8 6868
4255620 69b0 4700 57b8 671c 6a00 5aec 0200 53c7 6750 6af0 001c 4568 6d94 5370 4538 4af8 0000 2f7f 6bf4 247c 0015 366c 0020 382c
4255700 001c 3aa0 0019 d0cc 0018 aa50 aaf0 0001 ac4c 3958 2420 0000 0019 cf7c 0019 44a8 0000 0038 b27c b66c 0000 12df 0000 1313
4255760 0019 44f0 0200 0db5 0500 1cdd 0000 8a17 0000 0013 0000 3287 00ce 8663 c000 0453 0000 315f 0019 44ec 0000 0044 56f8 6854
4256040 69b0 5758 6160 5b58 0200 8667 6784 6aa0 56f8 671c 6a00 5aec 0100 87bf 6750 3a4c 0019 d180 001c 3818 3bf4 0000 0019 d1a0
4256120 0014 2330 0019 d0cc 0019 4624 0000 0138 b27c b66c 0000 12e0 0000 1314 0019 3a60 0200 0db5 0500 1cdd 0000 8a1f 0000 001b
4256200 0000 3287 00ce 8c03 0000 0453 0000 315f 0019 4564 0000 0040 0000 0000 0000 0000 0000 0000 0000 0000 0019 d23c 0019 d294
4256260 0019 d338 0019 d480 0019 cffd 0019 d470 0019 d52c 0000 0000 0000 0000 0000 0000 0019 4684 0000 00c0 0000 0000 0000 0000
4256340 0000 0000 0000 0000 0000 0000 0000 0000 0000 0000 0000 0000 0000 0000 0000 0000 0000 0000 0000 0000 0000 0000 0000 0000
4256420 0019 c6d8 0019 c7d4 0019 c960 0019 cc88 0019 cdf4 0019 ce74 0019 d23c 0019 c750 0000 0000 0000 0000 0019 d4fc 0019 c898
4256500 0019 c824 0019 c9f8 0019 cb38 0019 cc2c 0019 cac8 0000 0000 0019 cb70 0019 cc0c 0000 0000 0000 0000 0019 cce0 0019 cda8
4256560 0000 0000 0019 d1f0 0019 cf1c 0019 cfb4 0019 cfec 0000 0000 0000 0000 0000 0000 0019 4684 0000 0060 2520 4700 33a0 3380
4256640 001c 247c 0019 d1e0 0020 3364 40b4 001c 0019 c888 001c 3d48 447c 0000 0300 5337 6a00 4af8 0000 5327 5fa0 247c 000c 4158
4256720 0018 3804 4538 6d80 5370 4568 6d0c 6b74 4538 4af8 0000 898f 6bf4 234c 0015 366c 0019 46f4 0000 0070 b27c b66c 0000 12e2
4257000 0000 1316 0019 46c0 0200 0db5 0500 1cdd 0000 89cf 0000 001b 0000 3287 00ce 74a3 0000 0453 0000 315f 0019 4774 0000 0038
4257060 b27c b66c 0000 12e3 0000 1317 0019 4778 0200 0db5 0500 1cdd 0000 8937 0000 000b 0000 3287 00ce 3483 0000 0453 0000 315f
4257140 0019 4774 0000 0080 5d10 0000 0400 58e7 671c 5fa0 5370 6840 5d10 0000 0100 2627 4b8c 0000 0000 8a37 320c 42ac 0000 5eef
4257220 0012 11f8 0018 33d8 320c 442c 0200 0ad7 4b8c 0000 0000 6317 4b8c 0000 0000 001b 447c 0000 0100 61bf 6c34 247c 0019 ce94
4257300 0018 3430 3d6c 320c 4300 0000 0000 6947 0013 390c 0014 37f0 3cf4 234c 0019 d25c 0019 47ac 0000 0038 b27c b66c 0000 12e4
4257360 0000 1319 0019 47dc 0200 0db5 0500 1cdd 0000 8a3f 0000 0013 0000 3287 00ce 92e3 0000 0453 0000 315f 0019 47d8 0000 002c
4257440 5758 6750 5370 5b58 0200 583f 4b8c 0000 0000 2f7f 6784 41e8 0000 000b 239c 0000 0019 d2b4 0019 4810 0000 0038 b27c b66c
4257520 0000 12e5 0000 1319 0019 486c 0200 0db5 0500 1cdd 0000 8a3f 0000 001b 0000 3287 00ce 95a3 0000 0453 0000 315f 0019 4868
4257600 0000 0058 56f8 6868 69b0 4700 57b8 671c 6a00 5aec 0200 53c7 6750 6af0 001c 4568 6d94 5370 4538 4af8 0000 2f7f 6bf4 247c
4257660 0015 366c 0020 382c 001c 3aa0 0019 d328 0018 aa50 aaf0 0001 ac4c 3858 2420 0000 0019 d2b4 0019 48a0 0000 0038 b27c b66c
4257740 0000 12e6 0000 131a 0019 4988 0200 0db5 0500 1cdd 0000 8a47 0000 0013 0000 3287 00ce 9943 0000 0453 0000 315f 0019 4984
4260020 0000 00e4 56f8 687c 0020 69b0 5758 6af0 0034 55f0 6af0 001c 6a00 3410 0038 3380 003c 3c9c 0000 0020 0019 d1e0 0040 3380
4260100 0024 411c 0000 003c 0019 c888 003c 3380 0028 4568 6e1c 0038 5370 4538 4b8c 0000 0000 898f 6bf4 247c 0015 366c 0038 34a0
4260160 002c 3894 0028 41e8 0000 24c7 3af4 0024 0019 d3d4 0038 3380 0030 4538 6e58 0020 5370 247c 000b 5408 0038 3894 0034 3e70
4260240 0030 411c 0000 002c 0019 d3f4 002c 3484 3eec 0028 4254 0000 0000 5327 40b4 0024 0019 d3d4 0024 3348 4538 6e58 0020 5370
4260320 24d0 0000 000b 5ef0 0020 3894 001c 3d48 40f4 0000 0019 d414 0014 2330 0019 d328 0019 49bc 0000 0038 b27c b66c 0000 12e7
4260400 0000 131b 0019 4a04 0200 0db5 0500 1cdd 0000 8a57 0000 001b 0000 3287 00ce 9fa3 0000 0453 0000 315f 0019 4a00 0000 0044
4260460 56f8 67b8 682c 5758 671c 6a00 57b8 6304 5de8 0000 0200 8667 6c34 6784 5758 6750 6a50 5b58 0100 87bf 6750 247c 0019 cbdc
4260540 0018 2ecc 23fc 0000 0019 d3f4 0019 4a70 0000 0070 b27c b66c 0000 12e8 0000 131c 0019 4a3c 0200 0db5 0500 1cdd 0000 8a5f
4260620 0000 001b 0000 3287 00ce a0a3 0000 0453 0000 315f 0019 4ab4 0000 0038 b27c b66c 0000 12e9 0000 131d 0019 4ab8 0200 0db5
4260700 0500 1cdd 0000 8a4f 0000 0023 0000 3287 00ce 9ea3 0000 0453 0000 315f 0019 4ab4 0000 0044 56f8 671c 682c 46ec 4768 5818
4260760 6750 6aa0 5d10 0000 0300 5337 671c 6d50 5fa0 3050 4568 6b74 5370 4538 6d94 6bf4 24d0 0000 0015 366c 001c 2304 0019 d3d4
4261040 0019 4aec 0000 0038 b27c b66c 0000 12ea 0000 131e 0019 4b28 0200 0db5 0500 1cdd 0000 8957 0000 0023 0000 3287 00ce 3b83
4261120 0000 0453 0000 315f 0019 4b24 0000 0038 45c4 46d8 4768 47e4 9314 9a90 9300 9a90 aa34 aa18 a554 0012 38e8 386c 37dc 3788
4261200 242c 0000 0019 d51c 23e4 0000 0019 d51c 0019 4b5c 0000 0038 b130 b66c 0000 12eb 0000 131f 0019 31b9 0200 0db5 0500 1cdd
4261260 0000 8a67 0000 0023 0000 3287 00ce a8e3 0000 0453 0000 315f 0019 4b9c 0000 0040 45dc 46d8 4754 5818 6750 6a50 3050 4568
4261340 6dd8 5370 4538 6d50 6bf4 247c 0015 366c 001c aa6c aaf0 0001 ac08 38d4 3858 37dc 242c 0000 0019 d51c 0019 5a3c 0000 060c
4261420 3e20 7772 6974 655f 7668 646c 5f6c 6973 7428 5369 676e 616c 7329 3b70 7269 6e74 2853 6967 6e61 6c73 2929 2c0a 0966 6f72
4261500 6d61 7428 2720 3a20 7e70 207e 7027 2c20 5b44 6972 6563 7469 6f6e 2c20 5479 7065 5d29 2e0a 0a25 2525 2520 5379 6e6f 7073
4261560 7973 2077 6169 7420 7374 6174 656d 656e 740a 2525 2525 2046 6f72 6d61 743a 0a25 2525 2520 2009 7761 6974 2075 6e74 696c
4261640 206e 6f74 2063 6c6b 2773 7461 626c 6520 616e 6420 636c 6b20 3d20 2731 273b 0a0a 7772 6974 655f 7668 646c 2873 796e 6f70
4261720 7379 735f 7761 6974 5f73 7461 7465 6d65 6e74 2853 6967 6e61 6c29 2920 3a2d 0a09 7668 646c 5f70 6f73 2854 6162 292c 0a09
4262000 666f 726d 6174 2822 7e6e 7e70 7761 6974 2075 6e74 696c 206e 6f74 207e 7027 7374 6162 6c65 2061 6e64 207e 7020 3d20 2731
```

| | | | | | | | | | | | | | | | | | | | | | | | | |
|---|---|---|---|---|---|---|---|---|---|---|---|---|---|---|---|---|---|---|---|---|---|---|---|---|
| 4262060 | 273b | 222c | 0a09 | 095b | 7668 | 646c | 5f74 | 6162 | 2854 | 6162 | 292c | 2053 | 6967 | 6e61 | 6c2c | 2053 | 6967 | 6e61 | 6c5d | 292e | 0a0a | 2525 | 2525 | 2049 |
| 4262140 | 6e6c | 696e | 6520 | 436f | 6d6d | 656e | 740a | 0a77 | 7269 | 7465 | 5f76 | 6864 | 6c28 | 696e | 6c69 | 6e65 | 5f63 | 6f6d | 6d65 | 6e74 | 2843 | 6f6d | 6d65 | 6e74 |
| 4262220 | 2929 | 203a | 2d0a | 096e | 6f6e | 7661 | 7228 | 436f | 6d6d | 656e | 7429 | 202d | 3e0a | 0909 | 6375 | 7272 | 656e | 745f | 706f | 7369 | 7469 | 6f6e | 2843 | 7572 |
| 4262300 | 506f | 7329 | 2c0a | 0909 | 7668 | 646c | 5f63 | 6f6d | 6d65 | 6e74 | 5f63 | 6f6c | 756d | 6e28 | 436f | 6d43 | 6f6c | 292c | 0a09 | 0928 | 4375 | 7250 | 6f73 | 203e |
| 4262360 | 2043 | 6f6d | 436f | 6c20 | 2d3e | 2043 | 6f6c | 2069 | 7320 | 4375 | 7250 | 6f73 | 202b | 2031 | 3b20 | 436f | 6c20 | 6973 | 2043 | 6f6d | 436f | 6c29 | 2c0a | 0909 |
| 4262440 | 666f | 726d | 6174 | 2827 | 7e2a | 7c2d | 2d20 | 7e70 | 272c | 205b | 436f | 6c2c | 2043 | 6f6d | 6d65 | 6e74 | 5d29 | 0a09 | 3b20 | 7472 | 7565 | 2e0a | 0a25 | 2525 |
| 4262520 | 2520 | 5573 | 6520 | 636c | 6175 | 7365 | 0a0a | 7772 | 6974 | 655f | 7668 | 646c | 2875 | 7365 | 5f63 | 6c61 | 7573 | 6528 | 5061 | 636b | 6167 | 6529 | 2920 | 3a2d |
| 4262600 | 0a09 | 666f | 726d | 6174 | 2827 | 7e6e | 7e6e | 5573 | 6520 | 776f | 726b | 2e7e | 702e | 616c | 6c3b | 272c | 205b | 5061 | 636b | 6167 | 655d | 292e | 0a0a | 2525 |
| 4262660 | 2525 | 2056 | 4844 | 4c20 | 5461 | 6220 | 616e | 6420 | 556e | 7461 | 6220 | 516e | 6420 | 5461 | 6269 | 6679 | 0a0a | 7772 | 6974 | 655f | 7668 | 646c | 2876 | 6864 |
| 4262740 | 6c5f | 7461 | 6228 | 5461 | 6229 | 2920 | 3a2d | 0a09 | 7668 | 646c | 5f74 | 6162 | 2854 | 6162 | 292c | 0a09 | 666f | 726d | 6174 | 2827 | 7e2a | 2b27 | 2c5b | 5461 |
| 4263020 | 625d | 292e | 0a0a | 7772 | 6974 | 655f | 7668 | 646c | 2876 | 6864 | 6c5f | 6e6f | 745f | 7461 | 6228 | 5461 | 6229 | 2920 | 3a2d | 0a09 | 7668 | 646c | 5f74 | 6162 |
| 4263100 | 2854 | 6162 | 292e | 0a0a | 7772 | 6974 | 655f | 7668 | 646c | 2876 | 6864 | 6c5f | 756e | 7461 | 6228 | 5461 | 6229 | 2920 | 3a2d | 0a09 | 7668 | 646c | 5f75 | 6e74 |
| 4263160 | 6162 | 2854 | 6162 | 292c | 0a09 | 666f | 726d | 6174 | 2827 | 7e2a | 2b27 | 2c5b | 5461 | 625d | 292e | 0a0a | 7772 | 6974 | 655f | 7668 | 646c | 2876 | 6864 | 6c5f |
| 4263240 | 7461 | 6269 | 6679 | 2854 | 6162 | 2929 | 203a | 2d0a | 0976 | 6864 | 6c5f | 7461 | 6269 | 6679 | 2854 | 6162 | 292e | 0a0a | 7772 | 6974 | 655f | 7668 | 646c | 286c |
| 4263320 | 6973 | 7428 | 4c69 | 7374 | 2929 | 203a | 2d0a | 0977 | 7269 | 7465 | 5f76 | 6864 | 6c5f | 6c69 | 7374 | 284c | 6973 | 7429 | 2e0a | 2525 | 2525 | 2525 | 2525 | 2525 |
| 4263400 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 4263460 | 2525 | 2525 | 2525 | 2525 | 2525 | 2525 | 2525 | 2525 | 2525 | 250a | 2525 | 2525 | 2057 | 7269 | 7465 | 2061 | 206c | 6973 | 7420 | 6f66 | 2076 | 6864 | 6c20 | 656c |
| 4263540 | 656d | 656e | 7473 | 0a0a | 7772 | 6974 | 655f | 7668 | 646c | 285b | 5d29 | 203a | 2d20 | 212e | 0a77 | 7269 | 7465 | 5f76 | 6864 | 6c28 | 5b45 | 6c65 | 6d65 | 6e74 |
| 4263620 | 7c52 | 6573 | 7451 | 2920 | 3a2d | 0a09 | 666f | 726d | 6174 | 2827 | 7e70 | 272c | 205b | 456c | 656d | 656e | 745d | 292c | 212c | 0a09 | 7772 | 6974 | 655f | 7668 |
| 4263700 | 646c | 2852 | 6573 | 7429 | 2e0a | 0a25 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 4263760 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 0a25 | 2525 | 2520 | 5772 |
| 4264040 | 6974 | 6520 | 6120 | 272c | 2720 | 7365 | 7061 | 7261 | 7465 | 6420 | 6c69 | 7374 | 206f | 6620 | 7668 | 646c | 2065 | 6c65 | 6165 | 6e74 | 7320 | 6672 | 6f6d | 2061 |
| 4264120 | 206c | 6973 | 740a | 0a77 | 0019 | 5118 | 0000 | 002c | b288 | b66c | 0000 | 1291 | 7fff | ffff | 0019 | 979c | 0200 | 0db5 | 0100 | 15ad | 0100 | 33fd | 0000 | 000b |
| 4264200 | 0000 | 315f | 0019 | 5144 | 0000 | 002c | b288 | b66c | 0000 | 1291 | 7fff | ffff | 0019 | 50f0 | 0200 | 0db5 | 0100 | 15ad | 0100 | 33fd | 0000 | 000b | 0000 | 315f |
| 4264260 | 0019 | 517c | 0000 | 0038 | b27c | b66c | 0000 | 1292 | 0000 | 12a6 | 0019 | 5a40 | 0200 | 0db5 | 0500 | 1cdd | 0000 | 8567 | 0000 | 000b | 0000 | 3287 | 00cc | bbe3 |
| 4264340 | 0000 | 0043 | 0000 | 315f | 0019 | 5a3c | 0000 | 002c | b4f0 | b4e4 | 0000 | 1291 | 7fff | ffff | 0008 | b0dd | 0000 | 0000 | 0000 | 0000 | 0019 | 65d8 | 0002 | 438a |
| 4264420 | 0019 | a1bc | 27f0 | 0128 | 0019 | 52cc | 5d10 | 0000 | 0500 | 582f | 671c | 687c | 0020 | 6af0 | 001c | 6aa0 | 6a50 | 5aec | 0100 | 2627 | 69b0 | 9300 | 9460 | 0018 |
| 4264500 | 4550 | 6d3c | 5370 | 42ac | 0000 | 860f | 0008 | c0fc | 0024 | 2c88 | 0002 | 329c | 24d0 | 0000 | 0019 | 97b0 | 0024 | 43c0 | 0100 | 8627 | 6d50 | 4550 | 6b74 | 5370 |
| 4264560 | 4300 | 0000 | 0000 | 861f | 0008 | c0fc | 0024 | 9350 | 0020 | 9460 | 001a | 4550 | 6e58 | 0020 | 5370 | 42ac | 0000 | 862f | 0008 | c0fc | 0020 | 2c88 | 0002 | 43c0 |
| 4264640 | 0100 | 8637 | 5fa0 | 247c | 0019 | 977c | 0020 | 3c9c | 0000 | 001c | 0019 | 977c | 001c | 3aa0 | 0019 | 977c | 0018 | 43c0 | 0100 | 8627 | 6d50 | 4550 | 6b74 | 5370 |
| 4264720 | 4300 | 0000 | 0000 | 863f | 0008 | c0fc | 0018 | 43c0 | 0100 | 8637 | 5fa0 | 247c | 0019 | 977c | 0018 | 3a4c | 0019 | 977c | 0014 | 43c0 | 0100 | 8627 | 6d50 | 4550 |
| 4265000 | 6b74 | 5370 | 4300 | 0000 | 0000 | 8647 | 0008 | c0fc | 0010 | 9300 | 9460 | 0018 | 4550 | 6d3c | 5370 | 42ac | 0000 | 864f | 0008 | c0fc | 000c | 2c88 | 0002 | 41d4 |
| 4265060 | 0000 | 0ddf | 242c | 0000 | 0008 | d63c | 28c4 | 0118 | 0019 | 53e4 | 5d10 | 0000 | 0400 | 58e7 | 671c | 687c | 001c | 6aa0 | 6a50 | 5aec | 0100 | 2627 | 69b0 | 9300 |
| 4265140 | 9460 | 0018 | 4550 | 6d3c | 5370 | 42ac | 0000 | 860f | 0008 | c0fc | 0020 | 2c88 | 0002 | 329c | 24d0 | 0000 | 0019 | 97b0 | 0020 | 43c0 | 0100 | 8627 | 6d50 | 4550 |
| 4265220 | 6b74 | 5370 | 4300 | 0000 | 0000 | 8657 | 0008 | c0fc | 0020 | 9350 | 001c | 9460 | 001a | 4550 | 6e58 | 001c | 5370 | 42ac | 0000 | 862f | 0008 | c0fc | 001c | 2c88 |
| 4265300 | 0002 | 43c0 | 0100 | 8637 | 5fa0 | 247c | 0019 | 977c | 001c | 3aa0 | 0019 | 977c | 0018 | 43c0 | 0100 | 8627 | 6d50 | 4550 | 6b74 | 5370 | 4300 | 0000 | 0000 | 863f |
| 4265360 | 0008 | c0fc | 0018 | 43c0 | 0100 | 8637 | 5fa0 | 247c | 0019 | 977c | 0018 | 3a4c | 0019 | 977c | 0014 | 43c0 | 0100 | 8627 | 6d50 | 4550 | 6b74 | 5370 | 4300 | 0000 |
| 4265440 | 0000 | 865f | 0008 | c0fc | 0010 | 9300 | 9460 | 0018 | 4550 | 6d3c | 5370 | 42ac | 0000 | 864f | 0008 | c0fc | 000c | 2c88 | 0002 | 41d4 | 000c | 0ddf | 242c | 0000 |
| 4265520 | 0008 | d63c | 28c4 | 0048 | 0019 | 542c | 5d10 | 0000 | 0200 | 8667 | 682c | 6a00 | 32b8 | 247c | 0019 | 97b0 | 0018 | 4408 | 0100 | 8627 | 6d94 | 4550 | 6d80 | 5370 |
| 4265600 | 4538 | 6d3c | 6bb4 | 4550 | 6bf4 | 6b74 | 4240 | 0000 | 0000 | 866f | 242c | 0000 | 0008 | c0fc | 28c4 | 0078 | 0019 | 54a4 | 5d10 | 0000 | 0200 | 583f | 682c | 6a00 |
| 4265660 | 32b8 | 247c | 0019 | 97b0 | 0018 | 4408 | 0100 | 8627 | 6d94 | 442c | 0100 | 8637 | 5fa0 | 450c | 0000 | 0018 | 0100 | 8637 | 5fa0 | 43e4 | 0100 | 8627 | 6d94 | 4538 |
| 4265740 | 6bb4 | 5370 | 4550 | 6d80 | 6b74 | 4538 | 6c84 | 0018 | 6bb4 | 4550 | 6c34 | 6b74 | 4538 | 6d3c | 6bb4 | 4550 | 6bf4 | 6b74 | 4240 | 0000 | 0000 | 8677 | 242c | 0000 |
| 4266020 | 0008 | c0fc | 28c4 | 0050 | 0019 | 54f4 | 5d10 | 0000 | 0200 | 53c7 | 6464 | 4408 | 0100 | 8687 | 5fa0 | 450c | 0000 | 0018 | 0100 | 8637 | 5fa0 | 4538 | 6bb4 | 5370 |
| 4266100 | 4550 | 6c84 | 0018 | 6b74 | 4538 | 6c34 | 6bb4 | 4550 | 6bf4 | 6b74 | 4240 | 0000 | 0000 | 867f | 239c | 0000 | 0008 | c0fc | 28c4 | 0064 | 0019 | 5558 | 5d10 | 0000 |
| 4266160 | 0200 | 5baf | 682c | 6a00 | 32b8 | 247c | 0019 | 97b0 | 0018 | 4408 | 0100 | 8627 | 6d94 | 442c | 0100 | 8637 | 5fa0 | 43c0 | 0100 | 8627 | 6d94 | 4550 | 6b74 | 5370 |
| 4266240 | 4538 | 6d80 | 6bb4 | 4550 | 6c34 | 6b74 | 4538 | 6d3c | 6bb4 | 4550 | 6bf4 | 6b74 | 4240 | 0000 | 0000 | 868f | 242c | 0000 | 0008 | c0fc | 28c4 | 0050 | 0019 | 55a8 |
| 4266320 | 5d10 | 0000 | 0200 | 52a7 | 6464 | 4408 | 0100 | 8687 | 5fa0 | 450c | 0000 | 0018 | 0100 | 8637 | 5fa0 | 4538 | 6bb4 | 5370 | 4550 | 6c84 | 0018 | 6b74 | 4538 | 6c34 |
| 4266400 | 6bb4 | 4550 | 6bf4 | 6b74 | 4240 | 0000 | 0000 | 8697 | 239c | 0000 | 0008 | c0fc | 28c4 | 0044 | 0019 | 55ec | 5d10 | 0000 | 0100 | 529f | 671c | 4408 | 0100 | 8687 |
| 4266460 | 5fa0 | 442c | 0100 | 8637 | 5fa0 | 4550 | 6b74 | 5370 | 4538 | 6c34 | 6bb4 | 4550 | 6bf4 | 6b74 | 4240 | 0000 | 0000 | 869f | 239c | 0000 | 0008 | c0fc | 28c4 | 0080 |
| 4266540 | 0019 | 56ac | 5d10 | 0000 | 0200 | 57d7 | 6840 | 69b0 | 32d4 | 247c | 0019 | 97b0 | 001c | 43c0 | 0100 | 8627 | 6dd8 | 4550 | 6b74 | 5370 | 4300 | 0000 | 0000 | 86a7 |
| 4266620 | 0008 | c0fc | 0018 | 2e7c | adec | 2ba0 | 0018 | 001c | 3ba0 | 0000 | 000d | 7d48 | 0018 | aa50 | 2e98 | 39f8 | 0019 | 98dc | 0014 | 2c88 | 000e | 2c58 | 3ba0 | 0000 |
| 4266700 | 0008 | ec1c | 0010 | 4550 | 6d3c | 5370 | 4240 | 0000 | 0000 | 86b7 | 242c | 0000 | 0008 | c0fc | 003c | 7e6e | 6172 | 6368 | 6974 | 6563 | 7475 | 7265 | 207e | 7020 |
| 4266760 | 6f66 | 207e | 7020 | 6973 | 7e6e | 7e70 | 7e70 | 7e6e | 7e6e | 6265 | 6769 | 6e7e | 6e7e | 707e | 707e | 6e7e | 6e65 | 6e64 | 207e | 703b | 7e6e | 0000 | 28c4 | 0064 |
| 4267040 | 0019 | 5710 | 5d10 | 0000 | 0300 | 57af | 4b8c | 0000 | 0000 | 86bf | 6840 | 69b0 | 3050 | 32b8 | 24d0 | 0000 | 0019 | 97b0 | 0018 | 4408 | 0100 | 8627 | 6d94 | 4538 |
| 4267120 | 6d80 | 5370 | 4550 | 6bf4 | 6b74 | 42ac | 0000 | 86c7 | 0008 | c0fc | 0010 | 39a4 | 0019 | 98dc | 000c | 4368 | 4240 | 0000 | 0000 | 86cf | 242c | 0000 | 0008 | c0fc |

| | | | | | | | | | | | | | | | | | | | | | | | | |
|---|---|---|---|---|---|---|---|---|---|---|---|---|---|---|---|---|---|---|---|---|---|---|---|---|
| 4267200 | 28c4 | 004c | 0019 | 575c | 5d10 | 0000 | 0300 | 57af | 5fa0 | 682c | 6a00 | 32b8 | 24d0 | 0000 | 0019 | 97b0 | 0018 | 4408 | 0100 | 8627 | 6d94 | 4550 | 6d80 | 5370 |
| 4267260 | 4538 | 6d3c | 6bb4 | 4550 | 6bf4 | 6b74 | 4240 | 0000 | 0000 | 86d7 | 242c | 0000 | 0008 | c0fc | 28c4 | 004c | 0019 | 57a8 | 5d10 | 0000 | 0300 | 57c7 | 5fa0 | 682c |
| 4267340 | 6a00 | 32b8 | 24d0 | 0000 | 0019 | 97b0 | 0018 | 4408 | 0100 | 8627 | 6d94 | 4550 | 6d80 | 5370 | 4538 | 6d3c | 6bb4 | 4550 | 6bf4 | 6b74 | 4240 | 0000 | 0000 | 86df |
| 4267420 | 242c | 0000 | 0008 | c0fc | 28c4 | 0034 | 0019 | 57dc | 5d10 | 0000 | 0300 | 5ac7 | 67b8 | 62c0 | 4550 | 6b74 | 5370 | 4538 | 6c34 | 6bb4 | 4550 | 6bf4 | 6b74 | 41d4 |
| 4267500 | 0000 | 86e7 | 239c | 0000 | 0008 | c0fc | 28c4 | 002c | 0019 | 5808 | 5d10 | 0000 | 0200 | 5ac7 | 6304 | 4538 | 6bb4 | 5370 | 4550 | 6bf4 | 6b74 | 41d4 | 0000 | 86ef |
| 4267560 | 239c | 0000 | 0008 | c0fc | 28c4 | 00a8 | 0019 | 58b0 | 5d10 | 0000 | 0200 | 86f7 | 6854 | 69b0 | 4300 | 0000 | 0000 | 0003 | 0019 | 97b0 | 0018 | 332c | 4300 | 0000 |
| 4267640 | 0000 | 86ff | 0015 | a7f8 | 0018 | 4368 | 4300 | 0000 | 0000 | 8707 | 0008 | c0fc | 0018 | 4550 | 6dc4 | 5370 | 4300 | 0000 | 0000 | 870f | 0008 | c0fc | 0014 | 4550 |
| 4267720 | 6d50 | 5370 | 4300 | 0000 | 0000 | 8717 | 0008 | c0fc | 0010 | 4550 | 4b8c | 0000 | 0000 | 8727 | 5370 | 42ac | 0000 | 871f | 0008 | c0fc | 0010 | 4368 | 4300 | 0000 |
| 4270000 | 0000 | 8707 | 0008 | c0fc | 0010 | 4550 | 6d3c | 5370 | 4240 | 0000 | 0000 | 872f | 242c | 0000 | 0008 | c0fc | 28c4 | 0070 | 0019 | 594c | 5d10 | 0000 | 0200 | 59a7 |
| 4270060 | 682c | 6a00 | 32b8 | 247c | 0019 | 97b0 | 0018 | 4408 | 0100 | 8627 | 6d94 | 442c | 0100 | 8637 | 5fa0 | 450c | 0000 | 0018 | 0100 | 8627 | 6d94 | 4538 | 6d3c | 5370 |
| 4270140 | 4550 | 6c84 | 0018 | 6b74 | 4538 | 6d80 | 6bb4 | 4550 | 6c34 | 6b74 | 4538 | 6d3c | 6bb4 | 4550 | 6bf4 | 6b74 | 4240 | 0000 | 0000 | 8737 | 242c | 0000 | 0008 | c0fc |
| 4270220 | 0027 | 7e6e | 7e6e | 7e70 | 7061 | 636b | 6167 | 6520 | 626f | 6479 | 207e | 7020 | 6973 | 7e70 | 7e70 | 7e6e | 7e70 | 656e | 6420 | 7e70 | 3b00 | 7479 | 28c4 | 0070 |
| 4270300 | 0019 | 59bc | 5d10 | 0000 | 0200 | 5d0f | 682c | 6a00 | 32b8 | 247c | 0019 | 97b0 | 0018 | 4408 | 0100 | 8627 | 6d94 | 442c | 0100 | 8637 | 5fa0 | 450c | 0000 | 0018 |
| 4270360 | 0100 | 8627 | 6d94 | 4538 | 6d3c | 5370 | 4550 | 6c84 | 0018 | 6b74 | 4538 | 6d80 | 6bb4 | 4550 | 6c34 | 6b74 | 4539 | 6d3c | 6bb4 | 4550 | 6bf4 | 6b74 | 4240 | 0000 |
| 4270440 | 0000 | 873f | 242c | 0000 | 0008 | c0fc | 28c4 | 0050 | 0019 | 5a8c | 5d10 | 0000 | 0200 | 599f | 682c | 6a00 | 4300 | 0000 | 0000 | 0003 | 0019 | 97b0 | 0014 | 4408 |
| 4270520 | 0100 | 8637 | 5fa0 | 4538 | 6d3c | 5370 | 4550 | 6d80 | 6b74 | 4538 | 6bf4 | 6bb4 | 4550 | 6d3c | 6b74 | 41d4 | 0000 | 8747 | 242c | 0000 | 0008 | c0fc | 2954 | 002c |
| 4270600 | 0002 | 438a | 56f9 | 671c | 682c | 4550 | 6b74 | 5370 | 4300 | 0000 | 0000 | 87ef | 0008 | c0fc | 0010 | 2ecc | 2420 | 0000 | 0019 | 977c | 0019 | 6110 | 0000 | 0038 |
| 4270660 | b27c | b66c | 0000 | 1293 | 0000 | 12a7 | 0019 | 6114 | 0200 | 0db5 | 0500 | 1cdd | 0000 | 86af | 0000 | 000b | 0000 | 3287 | 00cc | c6e3 | 0000 | 0443 | 0000 | 315f |
| 4270740 | 0017 | 7668 | 646c | 5f64 | 6573 | 6967 | 6e5f | 6465 | 7363 | 7269 | 7074 | 696f | 6e00 | 9c00 | 28c4 | 0080 | 0019 | 5b38 | 5d10 | 0000 | 0400 | 5237 | 682c | 6a00 |
| 4271020 | 6a50 | 6aa0 | 4300 | 0000 | 0000 | 0003 | 0019 | 97b0 | 0020 | 32f0 | 001c | 247c | 0019 | 9a64 | 0020 | 4408 | 0100 | 8637 | 6e1c | 001c | 44e8 | 0000 | 0100 | 8637 |
| 4271100 | 5e1c | 001c | 4550 | 6d3c | 5370 | 4538 | 6e08 | 6bb4 | 4550 | 6c34 | 6b74 | 4538 | 6dc4 | 6bb4 | 4550 | 6bf4 | 6b74 | 4538 | 6d80 | 6bb4 | 4550 | 6d3c | 6b74 | 41d4 |
| 4271160 | 0000 | 874f | 242c | 0000 | 0008 | c0fc | 0026 | 7e6e | 7e70 | 636f | 6d70 | 6f6e | 656e | 7420 | 7e70 | 7e70 | 7e70 | 7e6e | 7e70 | 656e | 6420 | 636f | 6d70 | 6f6e |
| 4271240 | 656e | 743b | 006e | 6b29 | 28c4 | 0064 | 0019 | 5b9c | 5d10 | 0000 | 0200 | 57e7 | 682c | 6a00 | 32b8 | 247c | 0019 | 97b0 | 0018 | 4408 | 0100 | 8627 | 6d94 | 442c |
| 4271320 | 0100 | 8637 | 5fa0 | 43c0 | 0100 | 8627 | 6d94 | 4550 | 6b74 | 5370 | 4538 | 6d80 | 6bb4 | 4550 | 6c34 | 6b74 | 4539 | 6d3c | 6bb4 | 4550 | 6bf4 | 6b74 | 4240 | 0000 |
| 4271400 | 0000 | 8757 | 242c | 0000 | 0008 | c0fc | 28c4 | 0060 | 0019 | 5bfc | 5d10 | 0000 | 0100 | 581f | 682c | 329c | 24d0 | 0000 | 0019 | 97b0 | 0014 | 4408 | 0100 | 8627 |
| 4271460 | 6d50 | 43e4 | 0100 | 8767 | 5fa0 | 4538 | 6bb4 | 5370 | 4550 | 6bf4 | 6b74 | 42ac | 0000 | 875f | 0008 | c0fc | 0010 | 39a4 | 0019 | 9ac8 | 000c | 4368 | 4240 | 0000 |
| 4271540 | 0000 | 8777 | 242c | 0000 | 0009 | c0fc | 28c4 | 0058 | 0019 | 5c54 | 5d10 | 0000 | 0300 | 877f | 671c | 6840 | 6a50 | 5aec | 0100 | 2627 | 69b0 | 32d4 | 24d0 | 0000 |
| 4271620 | 0019 | 97b0 | 001c | 4408 | 0100 | 8627 | 6dd8 | 4538 | 6dc4 | 5370 | 4550 | 6d80 | 6b74 | 4538 | 6d3c | 6bb4 | 4550 | 6bf4 | 6b74 | 41d4 | 0000 | 8787 | 242c | 0000 |
| 4271700 | 0008 | c0fc | 28c4 | 0034 | 0019 | 5c88 | 5d10 | 0000 | 0100 | 878f | 682c | 42ac | 0000 | 8797 | 0008 | d63c | 0010 | 39a4 | 0019 | 98dc | 000c | 41d4 | 0000 | 0a7f |
| 4271760 | 242c | 0000 | 0008 | d63c | 28c4 | 002c | 0019 | 5cb4 | 5d10 | 0000 | 0200 | 879f | 6304 | 4538 | 6bb4 | 5370 | 4550 | 6bf4 | 6b74 | 41d4 | 0000 | 87a7 | 239c | 0000 |
| 4272040 | 0008 | c0fc | 28c4 | 0060 | 0019 | 5d14 | 5d10 | 0000 | 0300 | 5337 | 6854 | 69b0 | 6a00 | 2e7c | ae30 | 2ba0 | 001c | 001c | 3bf4 | 0000 | 000d | 7d48 | 001c | aa6c |
| 4272120 | 2e98 | 3a4c | 0019 | 98dc | 0018 | 2c88 | 000e | 2c58 | 3bf4 | 0000 | 0008 | d63c | 0014 | 4538 | 6d80 | 5370 | 4550 | 6d3c | 6b74 | 41d4 | 0000 | 87af | 242c | 0000 |
| 4272200 | 0008 | c0fc | 28c4 | 0234 | 0019 | 5f48 | 5d10 | 0000 | 0100 | 87b7 | 682c | 329c | 24d0 | 0000 | 0019 | 97b0 | 0014 | 4408 | 0100 | 8627 | 6d50 | 4550 | 6d3c | 5370 |
| 4272260 | 4538 | 6d3c | 6bb4 | 4550 | 6bf4 | 6b74 | 4568 | 4af8 | 0000 | 01db | 5370 | 4538 | 4b8c | 0000 | 0000 | 013b | 6bf4 | 4568 | 4b8c | 0000 | 0000 | 018b | 6b74 | 4538 |
| 4272340 | 4b8c | 0000 | 0000 | 013b | 6bf4 | 4568 | 4b8c | 0000 | 0000 | 0103 | 6b74 | 4538 | 4b8c | 0000 | 0000 | 01eb | 6bf4 | 4568 | 4b8c | 0000 | 0000 | 0103 | 6b74 | 4538 |
| 4272420 | 4b8c | 0000 | 0000 | 0383 | 6bf4 | 4568 | 4b8c | 0000 | 0000 | 03f3 | 6b74 | 4538 | 4b8c | 0000 | 0000 | 0103 | 6bf4 | 4568 | 4b8c | 0000 | 0000 | 0323 | 6b74 | 4538 |
| 4272500 | 4b8c | 0000 | 0000 | 0373 | 6bf4 | 4568 | 4b8c | 0000 | 0000 | 030b | 6b74 | 4538 | 4b8c | 0000 | 0000 | 0103 | 6bf4 | 4568 | 4b8c | 0000 | 0000 | 032b | 6b74 | 4538 |
| 4272560 | 4b8c | 0000 | 0000 | 0363 | 6bf4 | 4568 | 4b8c | 0000 | 0000 | 0313 | 6b74 | 4538 | 4b8c | 0000 | 0000 | 030b | 6bf4 | 4568 | 4b8c | 0000 | 0000 | 03a3 | 6b74 | 4538 |
| 4272640 | 4b8c | 0000 | 0000 | 039b | 6bf4 | 4568 | 4b8c | 0000 | 0000 | 013b | 6b74 | 4538 | 4b8c | 0000 | 0000 | 0383 | 6bf4 | 4568 | 4b8c | 0000 | 0000 | 03f3 | 6b74 | 4538 |
| 4272720 | 4b8c | 0000 | 0000 | 0103 | 6bf4 | 4568 | 4b8c | 0000 | 0000 | 03a3 | 6b74 | 4538 | 4b8c | 0000 | 0000 | 037b | 6bf4 | 4568 | 4b8c | 0000 | 0000 | 0373 | 6b74 | 4538 |
| 4273000 | 4b8c | 0000 | 0000 | 0103 | 6bf4 | 4568 | 4b8c | 0000 | 0000 | 0363 | 6b74 | 4538 | 4b8c | 0000 | 0000 | 034b | 6bf4 | 4568 | 4b8c | 0000 | 0000 | 03a3 | 6b74 | 4538 |
| 4273060 | 4b8c | 0000 | 0000 | 0373 | 6bf4 | 4568 | 4b8c | 0000 | 0000 | 03ab | 6b74 | 4538 | 4b8c | 0000 | 0000 | 0103 | 6bf4 | 4568 | 4b8c | 0000 | 0000 | 03a3 | 6b74 | 4538 |
| 4273140 | 4b8c | 0000 | 0000 | 034b | 6bf4 | 4568 | 4b8c | 0000 | 0000 | 030b | 6b74 | 4538 | 4b8c | 0000 | 0000 | 03bb | 6bf4 | 4568 | 4b8c | 0000 | 0000 | 0383 | 6b74 | 4538 |
| 4273220 | 4b8c | 0000 | 0000 | 03f3 | 6bf4 | 4568 | 4b8c | 0000 | 0000 | 0373 | 6b74 | 4538 | 4b8c | 0000 | 0000 | 03f3 | 6bf4 | 234c | 0008 | c0fc | 28c4 | 0062 | 0019 | 9bf4 |
| 4273300 | 5d10 | 0000 | 0100 | 87bf | 6840 | 9314 | 9460 | 004a | 32d4 | 247c | 0019 | 9bac | 001c | 32b8 | 24d0 | 0000 | 0019 | 9bcc | 001c | aa6c | aa50 | a4bc | 000e | aa6c |
| 4273360 | aaf0 | 0001 | ad64 | 2c88 | 0006 | aa50 | ad64 | 4538 | 6d80 | 5370 | 4550 | 6d3c | 6b74 | 41d4 | 0000 | 87d7 | 242c | 0000 | 0008 | c0fc | 22a0 | 636c | 28c4 | 0030 |
| 4273440 | 0019 | 9c24 | 5d10 | 0000 | 0100 | 8627 | 682c | 39a4 | 0019 | 9a64 | 0010 | 4550 | 6d3c | 5370 | 4240 | 0000 | 0000 | 87e7 | 242c | 0000 | 0008 | c0fc | 28c4 | 0030 |
| 4273520 | 0019 | 9c64 | 5d10 | 0000 | 0100 | 8687 | 682c | 39a4 | 0019 | 9c54 | 0010 | 4550 | 6d3c | 5370 | 4240 | 0000 | 0000 | 87e7 | 242c | 0000 | 0008 | c0fc | 0019 | 9cd8 |
| 4273600 | 0000 | 0000 | 0000 | 0000 | 0019 | 5ba8 | 0019 | 5fb8 | 0019 | 51b0 | 0019 | 9c3d | 0019 | 5438 | 0000 | 0000 | 0000 | 0000 | 0000 | 0000 | 0000 | 0000 | 0019 | 53f0 |
| 4273660 | 0000 | 0000 | 0000 | 0000 | 0000 | 0000 | 0019 | 5fe8 | 0000 | 0000 | 0000 | 0000 | 0019 | 9cc5 | 0019 | 5564 | 0000 | 0000 | 0000 | 0000 | 0000 | 0000 | 0019 | 9975 |
| 4273740 | 0000 | 0000 | 0000 | 0000 | 0000 | 0000 | 0019 | 52d8 | 0000 | 0000 | 0019 | 5814 | 0000 | 0000 | 0000 | 0000 | 0019 | 5958 | 0000 | 0000 | 0000 | 0000 | 0000 | 0000 |
| 4274020 | 0000 | 0000 | 0019 | 5cc0 | 0000 | 0000 | 0000 | 0000 | 0000 | 0000 | 0000 | 0000 | 0000 | 0000 | 0019 | 9c70 | 0000 | 0000 | 0000 | 0000 | 0019 | 5c08 | 0000 | 0000 |
| 4274100 | 0019 | 5c60 | 0000 | 0000 | 0019 | 9b29 | 0019 | 58bc | 0019 | 9915 | 0019 | 5d20 | 0019 | 5f54 | 0019 | 9955 | 0000 | 0000 | 0019 | 55f8 | 0000 | 0000 | 0019 | 5b44 |
| 4274160 | 0000 | 0000 | 0000 | 0000 | 0019 | 9c00 | 0019 | 61c0 | 0000 | 0070 | b27c | b66c | 0000 | 1294 | 0000 | 12a8 | 0019 | 614c | 0200 | 0db5 | 0500 | 1cdd | 0000 | 876f |
| 4274240 | 0000 | 0013 | 0000 | 3287 | 00cc | ec23 | 0000 | 0443 | 0000 | 315f | 0019 | 61c0 | 0000 | 0038 | b27c | b66c | 0000 | 1295 | 0000 | 12a9 | 0019 | 61c4 | 0200 | 0db5 |

```
4274320  0500 1cdd 0000 876f 0000 000b 0000 3287 00cc d643 0000 0443 0000 315f 2954 0040 0002 438a 56f8 6840 69b0 3050 32b8 247c
4274400  0019 97b0 0018 43e4 0100 8627 6394 4538 6bb4 5370 4550 6d80 6b74 42ac 0000 87ff 0008 c0fc 0010 2340 0019 9ac8 0019 6248
4274460  0000 0038 b27c b66c 0000 1296 0000 12aa 0019 624c 0200 0db5 0500 1cdd 0000 8807 0000 000b 0000 3287 00cc f3a3 0000 0443
4274540  0000 315f 2c78 0050 0002 438a 2520 9294 9460 0018 4550 6b48 5370 42ac 0000 880f 0008 c0fc 000c 2c88 0002 4408 0100 8627
4274620  671c 43e4 0100 8627 6b74 4538 6bb4 5370 4550 6bf4 6b74 41d4 0000 8817 242c 0000 0008 c0fc 0019 62d4 0000 0038 b27c b66c
4274700  0000 1297 0000 12ab 0019 62d8 0200 0db5 0500 1cdd 0000 881f 0000 000b 0000 3287 00cc f703 0000 0443 0000 315f 2c78 3054
4274760  0002 438a 2520 9294 9460 0026 44e8 0000 0100 8627 69b0 4568 6b48 5370 4550 6c34 6bf4 41d4 0000 8827 242c 0000 0008 c0fc
4275040  447c 0000 0100 8627 69b0 4550 6b74 5370 4240 0000 0000 882f 242c 0000 0008 c0fc 0019 63d0 0000 0070 b27c b66c 0000 1298
4275120  0000 12ac 0019 6310 0200 0db5 0500 1cdd 0000 87c7 0000 000b 0000 3287 00cc dd63 0000 0443 0000 315f 0019 63d0 0000 0038
4275200  b27c b66c 0000 1299 0000 12ad 0019 63d4 0200 0db5 0500 1cdd 0000 8837 0000 000b 0000 3287 00cc fbe3 0000 0443 0000 315f
4275260  2c78 008c 0002 438a 45b8 9300 9460 0042 44a0 0000 0100 883f 5fa0 43c0 0200 0daf 4b8c 0000 0000 3287 6bb4 247c 0008 db9c
4275340  0010 43e4 0100 883f 6d0c 43c0 0200 0daf 4b8c 0000 0000 3287 6bb4 234c 0008 b2fc 2ba0 0010 000c 39a4 0019 9fac 0010 2eb0
4275420  2c58 3774 4e1c 0000 0000 0003 44a0 0000 0100 883f 6d0c 43c0 0200 0daf 4b8c 0000 0000 3287 6bb4 234c 0008 b2fc 0019 644c
4275500  0000 0038 b27c b66c 0000 129a 0000 12ae 0019 6450 0200 0db5 0500 1cdd 0000 8627 0000 000b 0000 3287 00cc d323 0000 0443
4275560  0000 315f 2c78 0044 0002 438a 45b8 9300 93a8 002e 32b8 247c 0019 9f7c 0018 329c 24d0 0000 0019 9ffc 0018 aa50 aa34 9eb8
4275640  aaf0 0001 aa34 9de0 af34 2340 0019 9f7c 2420 0000 0019 9f7c 0019 64f4 0000 0078 b27c b66c 0000 129b 0000 12af 0019 64f8
4275720  0200 0db5 0500 1cdd 0000 8687 0000 000b 0000 3287 00cc e2a3 0000 0443 0000 315f 0019 64f4 0000 0040 0019 a044 0000 0000
4276000  0019 9fcc 0000 0000 0019 9f8c 0019 a084 0019 a074 0019 a064 0000 0000 0000 0000 0019 a01c 0000 0000 0000 0000 0000 0000
4276060  2c78 0030 0002 438a 45b8 32b8 24d0 0000 0019 9f7c 0018 329c 24d0 0000 0019 9ffc 0018 aa50 aa34 9db0 af34 2340 0019 9f7c
4276140  0019 6664 0000 0118 b27c b66c 0000 129c 0000 12b0 0019 6530 0200 0db5 0500 1cdd 0000 8767 0000 000b 0000 3287 00cc e463
4276220  0000 0443 0000 315f 0019 6564 0000 0038 b27c b66c 0000 129d 0000 12b1 0019 6568 0200 0db5 0500 1cdd 0000 8617 0000 000b
4276300  0000 3287 00cc bd83 0000 0443 0000 315f 0019 659c 0000 0038 b27c b66c 0000 129e 0000 12b2 0019 65a0 0200 0db5 0500 1cdd
4276360  0000 87cf 0000 000b 0000 3287 00cc de63 0000 0443 0000 315f 0019 65d4 0000 0038 b27c b66c 0000 129f 0000 12b3 0019 65d8
4276440  0200 0db5 0500 1cdd 0000 8847 0000 000b 0000 3287 00cc ffe3 0000 0443 0000 315f 0019 6664 0000 0038 b130 b66c 0000 12a0
4276520  0000 12b4 0019 5181 0200 0db5 0500 1cdd 0000 883f 0000 000b 0000 3287 00cc fd63 0000 0443 0000 315f 0000 002c 0019 6610
4276600  b4f0 b4e4 0000 12a0 7fff ffff 0019 9bcd 0000 0000 0000 0001 0019 a09c 0002 438a 0019 a0bc 0000 002c 0019 663c b4f0 b4e4
4276660  0000 12a1 7fff ffff 0019 9ff4 0000 0000 0000 0001 0019 a0d8 0002 438a 0019 a0f8 0019 72bc 0000 0a90 0000 0000 0000 0000
4276740  0000 0000 0000 0000 0000 0000 0000 0000 0000 0000 0000 0000 0000 0000 0000 0000 0000 0000 0000 0000 0000 0000 0000 0000
*
4304140  0012 6164 645f 6c69 6e6b 696e 675f 636c 6175 7365 0000 0000 0012 6465 6c5f 6c69 6e6b 696e 675f 636c 6175 7365 0000 0000
4304220  000b 474c 0100 85bf 0000 85bf 0000 0004 0019 93c0 0019 93c0 0001 0089 0000 0000 0000 85bf b328 315f 0018 c1f4 0000 0000
4304300  000a f4ac 0100 85c7 0000 85bf 0000 0004 0019 9428 0019 9428 0001 0089 0000 0000 0000 85c7 b328 0000 0018 c228 0000 0000
4304360  000b 09a0 0100 85cf 0000 85bf 0000 0004 0019 9480 0019 9480 0001 0089 0000 0000 0000 85cf b328 0000 0018 c25c 0000 0000
4304440  000b 2614 0100 85d7 0000 85bf 0000 0004 0019 94d8 0019 94d8 0001 0089 0000 0000 0000 85d7 b328 0000 0018 c290 0000 0000
4304520  000b 45f8 0300 85df 0000 85bf 0000 000c 0019 9500 0019 9500 0001 0089 0000 0000 0000 85df b328 0000 0018 c2c4 0000 0000
4304600  000b 4ae4 0300 85e7 0000 85bf 0000 000c 0019 952c 0019 952c 0001 0089 0000 0000 0000 85e7 b328 0000 0018 c2f8 0000 0000
4304660  0100 85bf b328 0000 0018 c32c 0000 0000 0019 7240 0019 25c8 0100 85c7 b328 0000 0018 c35c 0000 0000 0100 85cf b328 0000
4304740  0018 c38c 0000 0000 0100 85d7 b328 0000 0018 c3bc 0000 0000 0300 85df b328 0000 0018 c3ec 0000 0000 0300 85e7 b328 0000
4305020  0018 c424 0000 0000 000a 2438 0000 0000 0019 7298 0019 72a8 0019 73d8 0000 002c b288 b66c 0000 1320 7fff ffff 0019 d7c8
4305100  0200 0db5 0100 15ad 0100 33fd 0000 000b 0000 315f 003d 2f68 6f6d 652f 6f73 6173 312f 612f 7669 6a61 792f 5648 444c 2f70
4305160  6172 7365 722f 7372 6f6c 6f67 2f6e 6577 6e65 772f 7633 2e31 2f63 6f6d 706f 6e65 6e74 7300 0040 2f68 6f6d 652f 6f73 6173
4305240  312f 612f 7669 6a61 792f 5648 444c 2f70 6172 7365 722f 7072 6f6c 6f67 2f6e 6577 6e65 772f 7633 2e31 2f63 6f6d 706f 6e65
4305320  6e74 732e 706c 0065 0000 002c 0019 d870 b27c b66c 0000 1323 7fff ffff 0019 30e8 0200 0db5 0200 2f35 0000 8a87 0000 045b
4305400  0000 315f 0000 002c 0019 d89c b27c b66c 0000 1329 7fff ffff 0019 3114 0200 0db5 0200 224d 0000 8a87 0000 3287 0000 315f
4305460  2c78 0014 0002 438a 56f8 671c 5370 22bc 0019 c6f8 0019 76e8 0000 0090 b27c b66c 0000 1325 0000 1328 000a d16d 0200 0db5
4305540  0200 270d 0000 8a87 0000 3287 0000 315f 0019 743c 0000 0038 b130 b66c 0000 1326 0000 132a 0019 7441 0200 0db5 0500 1cdd
4305620  0000 527f 0000 0013 0000 3287 00ce 4443 0000 045b 0000 315f 0019 76e8 0000 002c b4f0 b4e4 0000 1325 7fff ffff 0008 b0dd
4305700  0000 0000 0000 0000 0019 7408 0002 438a 0019 d5a0 27f0 007e 0019 74e4 4e1c 0000 0000 7477 5758 6160 5d7c 0000 0300 5337
4305760  4b8c 0000 0000 8a8f 4b8c 0000 0000 24c7 4b8c 0000 0000 88a7 56f8 6160 5d7c 0000 0300 5337 4b8c 0000 0000 8a97 4b8c 0000
4306040  0000 24c7 4b8c 0000 0000 88a7 56f8 671c 5370 5aec 0300 5337 4b8c 0000 0000 8a9f 4b8c 0000 0000 5327 4b8c 0000 0000 88a7
4306120  228c 7265 28c4 007e 0019 7564 4e1c 0000 0000 7487 5758 6160 5d7c 0000 0300 5337 4b8c 0000 0000 8a8f 4b8c 0000 0000 24c7
4306200  4b8c 0000 0000 88a7 56f8 6160 5d7c 0000 0300 5337 4b8c 0000 0000 8a97 4b8c 0000 0000 24c7 4b8c 0000 0000 88a7 56f8 671c
4306260  5370 5aec 0300 5337 4b8c 0000 0000 8a9f 4b8c 0000 0000 5327 4b8c 0000 0000 88a7 228c 7228 28c4 007e 0019 75e4 4e1c 0000
4306340  0000 7497 5758 6160 5d7c 0000 0300 5337 4b8c 0000 0000 8a8f 4b8c 0000 0000 24c7 4b8c 0000 0000 88a7 56f8 6160 5d7c 0000
4306420  0300 5337 4b8c 0000 0000 8a97 4b8c 0000 0000 24c7 4b8c 0000 0000 88a7 56f8 671c 5370 5aec 0300 5337 4b8c 0000 0000 8a9f
```

```
4306500  4b8c 0000 0000 5327 4b8c 0000 0000 88a7 229c 4964 28c4 007e 0019 7664 4e1c 0000 0000 74a7 5758 6160 5d7c 0000 0300 5337
4306560  4b8c 0000 0000 8a8f 4b8c 0000 0000 24c7 4b8c 0000 0000 88a7 56f8 6160 5d7c 0000 0300 5337 4b8c 0000 0000 8a97 4b8c 0000
4306640  0000 24c7 4b8c 0000 0000 88a7 56f8 671c 5370 5aec 0300 5337 4b8c 0000 0000 8a9f 4b8c 0000 0000 5327 4b8c 0000 0000 88a7
4306720  228c 676e 2954 007e 0002 438a 4e1c 0000 0000 74b7 5758 6160 5d7c 0000 0300 5337 4b8c 0000 0000 8a8f 4b8c 0000 0000 24c7
4307000  4b8c 0000 0000 88a7 56f8 6160 5d7c 0000 0300 5337 4b8c 0000 0000 8a97 4b8c 0000 0000 24c7 4b8c 0000 0000 88a7 56f8 671c
4307060  5370 5aec 0300 5337 4b8c 0000 0000 8a9f 4b8c 0000 0000 5327 4b8c 0000 0000 88d7 229c 2525 0019 a19c 0000 1bdc 2525 2525
4307140  2525 2525 2525 2525 2525 2525 2525 2525 2525 2525 2525 2525 2525 2525 2525 250a 6765 6e5f 7072 6f63 6573 735f 6375 5f61
4307220  6e64 5f62 696e 6469 6e67 7328 7072 6f63 6573 735f 7374 6174 656d 656e 7428 6c61 6265 6c28 6375 5f61 6e64 5f62 696e 6469
4307300  6e67 7329 2c5f 2c5b 5d2c 0a09 0909 0909 2020 2020 2020 5072 6f63 6573 7353 7461 7465 6d65 6e74 7329 293a 2d0a 0967 6574
4307360  6462 5f63 7572 7265 6e74 2864 6573 6967 6e2c 205f 4465 7369 676e 292c 0a09 6578 6973 7473 5f63 6f6e 7472 6f6c 5f73 7465
4307440  7073 2869 6428 702d 3329 2c20 5f2c 204e 292c 0a09 6f70 6572 6174 6f72 735f 696e 5f73 6368 6564 756c 6528 7363 6865 6475
4307520  6c65 2c20 5f2c 204e 2c20 4c69 7374 4f66 4f70 6572 6174 6f72 7329 2c0a 0967 656e 5f63 755f 616e 645f 6269 6e64 696e 6773
4307600  284c 6973 744f 664f 7065 7261 746f 7273 2c20 5072 6f63 6573 7353 7461 7465 6d65 6e74 7329 2e0a 0a67 656e 5f63 755f 616e
4307660  645f 6269 6e64 696e 6773 284c 6973 744f 664f 7065 7261 746f 7273 2c20 5b63 6173 655f 7374 6174 656d 656e 7428 7374 6174
4307740  652c 2057 6865 6e4c 6973 7429 5d29 203a 2d0a 0967 656e 5f63 755f 616e 645f 6269 6e64 696e 6773 284c 6973 744f 664f 7065
4310020  7261 746f 7273 2c20 312c 2057 6865 6e4c 6973 7429 2e0a 0a67 656e 5f63 755f 616e 645f 6269 6e64 696e 6773 285b 5d2c 205f
4310100  2c20 5b5d 292e 0a67 656e 5f63 755f 616e 645f 6269 6e64 696e 6773 285b 4f70 6572 6174 6f72 737c 4f70 4c69 7374 5d2c 204e
4310160  2c20 5b77 6865 6e28 5374 6174 652c 2041 7373 6967 6e6d 656e 7473 297c 5265 7374 5d29 203a 2d0a 0963 6f6e 6361 745f 6174
4310240  6f6d 285b 7374 6174 652c 4e5d 2c20 5374 6174 6529 2c0a 0967 656e 5f63 755f 616e 645f 6269 6e64 696e 6773 3128 4f70 6572
4310320  6174 6f72 732c 2041 7373 6967 6e6d 656e 7473 292c 0a09 4e65 7874 2069 7320 4e20 2b20 312c 0a09 6765 6e5f 6375 5f61 6e64
4310400  5f62 696e 6469 6e67 7328 4f70 4c69 7374 2c20 4e65 7874 2c20 5265 7374 292e 0a09 0a67 656e 5f63 755f 616e 645f 6269 6e64
4310460  696e 6773 3128 5b5d 2c20 5b5d 292e 0a67 656e 5f63 755f 616e 645f 6269 6e64 696c 6773 3128 5b4f 707c 4f70 735d 2c20 5b41
4310540  7373 496e 2c41 7373 4f75 747c 5265 7374 5d29 203a 2d0a 0966 756d 6170 284f 702c 2046 752c 204e 292c 0a09 636f 6d70 6f6e
4310620  656e 7428 4675 2c20 506f 7274 7329 2c0a 0963 6f6e 6361 745f 6174 6f6d 285b 6675 2c4e 5d2c 4675 5072 6566 6978 292c 0a09
4310700  636f 6d70 6f6e 656e 745f 706f 7274 5f73 6967 6e61 6c73 2850 6f72 7473 2c20 696e 2c20 4675 5072 6566 6978 2c20 506f 7274
4310760  7349 6e29 2c0a 096f 7065 7261 746f 725f 626c 6f63 6b5f 696e 7075 745f 7661 7273 285b 4f70 5d2c 2056 6172 7349 6e29 2c0a
4311040  096f 7065 7261 746f 725f 696e 7075 745f 6173 7369 676e 6d65 6e74 7328 506f 7274 7349 6e2c 2056 6172 7349 6e2c 2041 7373
4311120  496e 292c 0a09 636f 6d70 6f6e 656e 745f 706f 7274 5f73 6967 6e61 6c73 2850 6f72 7473 2c20 6f75 742c 2046 7550 7265 6669
4311200  782c 2050 6f72 7473 4f75 7429 2c0a 096f 7065 7261 746f 725f 626c 6f63 6b5f 6f75 7470 7574 5f76 6172 7328 5b4f 705d 2c20
4311260  5661 7273 4f75 7429 2c0a 096f 7065 7261 746f 725f 6f75 7470 7574 5f61 7373 6967 6e6d 656e 7473 2856 6172 734f 7574 2c20
4311340  506f 7274 734f 7574 2c20 4173 734f 7574 292c 0a09 6765 6e5f 6375 5f61 6e64 5f62 696e 6469 6e67 7331 284f 7073 2c20 5265
4311420  7374 292e 0a0a 6f70 6572 6174 6f72 5f69 6e70 7574 5f61 7373 6967 6e6d 656e 7473 285b 5d2c 205f 2c20 5b5d 292e 0a6f 7065
4311500  7261 746f 725f 696e 7075 745f 6173 7369 676e 6d65 6e74 7328 5b53 6967 6e61 6c7c 5369 676e 616c 735d 2c20 5b56 6172 7c56
4311560  6172 735d 2c0a 095b 7369 676e 616c 5f61 7373 6967 6e6d 656e 7428 5369 676e 616c 2c52 6567 6973 7465 7229 2c69 6e6c 696e
4311640  655f 636f 6d6d 656e 7428 4e61 6d65 297c 5265 7374 5d29 203a 2d0a 0972 6567 6973 7465 7228 5661 722c 204e 616d 652c 2052
4311720  6567 6973 7465 7229 2c21 2c0a 096f 7065 7261 746f 725f 696e 7075 745f 6173 7369 676e 6d65 6e74 7328 5369 676e 616c 732c
4312000  2056 6172 732c 5265 7374 292e 0a0a 6f70 6572 6174 6f72 5f6f 7574 7075 745f 6173 7369 676e 6d65 6e74 7328 5f2c 205f 2c20
4312060  5b5d 292e 0a2f 2a0a 6f70 6572 6174 6f72 5f6f 7574 7075 745f 6173 7369 676e 6d65 6e74 7328 5b5d 2c20 5f2c 205b 5d29 2e0a
4312140  6f70 6572 6174 6f72 5f6f 7574 7075 745f 6173 7369 676e 6d65 6e74 7328 5b56 6172 7c56 6172 735d 2c20 5b53 6967 6e61 6c7c
4312220  5369 676e 616c 735d 2c0a 095b 7369 676e 616c 5f61 7373 6967 6e6d 656e 7428 5265 6769 7374 6572 2c53 6967 6e61 6c29 2c69
4312300  6e6c 696e 655f 636f 6d6d 656e 7428 4e61 6d65 297c 5265 7374 5d29 203a 2d0a 0972 6567 6973 7465 7228 5661 722c 204e 616d
4312360  652c 2052 6567 6973 7465 7229 2c21 2c0a 096f 7065 7261 746f 725f 6f75 7470 7574 5f61 7373 6967 6e6d 656e 7473 2856 6172
4312440  732c 2053 6967 6e61 6c73 2c20 5265 7374 292e 0a2a 2f0a 636f 6d70 6f6e 656e 745f 706f 7274 5f73 6967 6e61 6c73 285b 5d2c
4312520  5f2c 5f2c 5b5d 2920 3a2d 2021 2e0a 636f 6d70 6f6e 656e 745f 706f 7274 5f73 6967 6e61 6c73 285b 506f 7274 7c54 6169 6c5d
4312600  2c20 5479 7065 2c20 5072 6566 6978 2c20 5b53 6967 6e61 6c7c 5265 7374 5d29 203a 2d0a 0950 6f72 7420 3d20 706f 7274 284e
4312660  616d 652c 5479 7065 2c5f 292c 2021 2c0a 0963 6f6e 6361 745f 6174 6f6d 285b 5072 6566 6978 2c4e 616d 655d 2c20 5369 676e
4312740  616c 292c 0a09 636f 6d70 6f6e 656e 745f 706f 7274 5f73 6967 6e61 6c73 2854 6169 6c2c 2054 7970 652c 2050 7265 6669 782c
4313020  2052 6573 7429 2e0a 636f 6d70 6f6e 656e 745f 706f 7274 5f73 6967 6e61 6c73 285b 5f50 6f72 747c 5461 696c 5d2c 2054 7970
4313100  652c 2050 7265 6669 782c 2052 6573 7429 203a 2d0a 0963 6f6d 706f 6e65 6e74 5f70 6f72 745f 7369 676e 616c 7328 5461 696c
4313160  2c20 5479 7065 2c20 5072 6566 6978 2c20 5265 7374 292e 0a0a 2525 2525 2525 2525 2525 2525 2525 2525 2525 2525 2525 2525
4313240  2525 2525 2525 2525 2525 2525 2525 2525 2525 2525 2525 2525 2525 2525 2525 2525 2525 2525 2525 2525 2525 2525 2525 2525
4313320  2525 2525 2525 0a25 2525 2520 4765 6e65 7261 6c20 5574 696c 6974 6965 7320 2873 686f 756c 6420 6265 2070 7574 2069 6e20
4313400  6120 6469 6666 6572 656e 7420 6669 6c65 290a 2525 2525 2525 2525 2525 2525 2525 2525 2525 2525 2525 2525 2525 2525 2525
4313460  2525 2525 2525 2525 2525 2525 2525 2525 2525 2525 2525 2525 2525 2525 2525 2525 2525 2525 2525 2525 2525 2525 2525 2525
4313540  0a0a 3a2d 2065 6e73 7572 655f 6c6f 6164 6564 286c 6962 7261 7279 2873 7472 696e 6773 2929 2e0a 0a0a 2525 2525 204c 6973
```

```
4313620  7420 6973 206f 6274 6169 6e65 6420 6279 2061 7070 656e 6469 6e67 2074 6865 206e 756d 6265 7273 205b 4c6f 7765 722c 5570
4313700  7065 725d 2c20 746f 2074 6865 2041 746f 6d2e 0a0a 7374 7269 6e67 6c69 7374 284c 6f77 6572 2c20 5570 7065 722c 2041 746f
4313760  6d2c 204c 6973 7429 203a 2d0a 0969 6e74 6567 6572 284c 6f77 6572 292c 0a09 696e 7465 6765 7228 5570 7065 7229 2c0a 0928
4314040  0a09 2020 2020 4c6f 7765 7220 3d3c 2055 7070 6572 202d 3e20 7374 7269 6e67 6c69 7374 3128 4c6f 7765 722c 2055 7070 6572
4314120  2c20 4174 6f6d 2c20 4c69 7374 290a 093b 0a09 2020 2020 7374 7269 6e67 6c69 7374 3128 5570 7065 722c 204c 6f77 6572 2c20
4314200  4174 6f6d 2c20 4c69 7374 290a 0929 2e0a 0a73 7472 696e 676c 6973 7431 284c 6f77 6572 2c20 4c6f 7765 722c 2041 746f 6d2c
4314260  205b 4c69 7374 5d29 203a 2d20 212c 0a09 636f 6e63 6174 5f61 746f 6d28 5b41 746f 6d2c 4c6f 7765 725d 2c4c 6973 7429 2e0a
4314340  7374 7269 6e67 6c69 7374 3128 4c6f 7765 722c 2055 7070 6572 2c20 4174 6f6d 2c20 5b45 6c65 6d65 6e74 7c4c 6973 745d 2920
4314420  3a2d 2021 2c0a 0963 6f6e 6361 745f 6174 6f6d 285b 4174 6f6d 2c4c 6f77 6572 5d2c 2045 6c65 6d65 6e74 292c 0a09 4e65 7874
4314500  2069 7320 4c6f 7765 722b 312c 0a09 7374 7269 6e67 6c69 7374 3128 4e65 7874 2c20 5570 7065 722c 2041 746f 6d2c 204c 6973
4314560  7429 2e0a 0a25 2525 2525 2525 2525 2525 2525 2525 2525 2525 2525 2525 2525 2525 2525 2525 2525 2525 2525 2525 2525 2525
4314640  2525 2525 2525 2525 2525 2525 2525 2525 2525 2525 2525 2525 2525 2525 2525 2525 2525 2525 250a 0a67 656e 5f69 6e74 6572 6661
4314720  6365 5f73 6967 6e61 6c73 2853 7472 7563 7475 7265 496e 7465 7266 6163 6553 6967 6e61 6c73 2920 3a2d 0a09 6765 7464 625f
4315000  6375 7272 656e 7428 6465 7369 676e 2c20 4465 7369 676e 292c 0a09 6465 7369 676e 5f66 756e 6374 696f 6e5f 756e 6974 7328
4315060  4465 7369 676e 2c20 4655 7329 2c0a 0967 656e 5f69 6e74 6572 6661 6365 5f73 6967 6e61 6c73 2846 5573 2c20 5374 7275 6374
4315140  7572 6549 6e74 6572 6661 6365 5369 676e 616c 7329 2e0a 0a67 656e 5f69 6e74 6572 6661 6365 5f73 6967 6e61 6c73 2846 5573
4315220  2c20 5374 7275 6374 7572 6549 6e74 6572 6661 6365 5369 676e 616c 7329 203a 2d0a 0967 656e 5f69 6e74 6572 6661 6365 5f73
4315300  6967 6e61 6c73 2846 5573 2c20 312c 2053 7472 7563 7475 7265 496e 7465 7266 6163 6553 6967 6e61 6c73 292e 0a0a 6765 6e5f
4315360  696e 7465 7266 6163 655f 7369 676e 616c 7328 5b5d 2c20 5f2c 205b 5d29 2e0a 6765 6e5f 696e 7465 7266 6163 655f 7369 676e
4315440  616c 7328 5b46 557c 4655 735d 2c20 4e2c 205b 4655 496e 7465 7266 6163 6553 6967 6e61 6c73 7c52 6573 745d 2920 3a2d 0a09
4315520  636f 6d70 6f6e 656e 7428 4655 2c20 506f 7274 7329 2c21 2c0a 0967 656e 5f70 6f72 745f 696e 7465 7266 6163 655f 7369 676e
4315600  616c 7328 506f 7274 732c 204e 2c20 4655 496e 7465 7266 6163 6553 6967 6e61 6c73 292c 0a09 4e65 7874 2069 7320 4e20 2b20
4315660  312c 0a09 6765 6e5f 696e 7465 7266 6163 655f 7369 676e 616c 7328 4655 732c 204e 6578 742c 2052 6573 7429 2e0a 0a67 656e
4315740  5f70 6f72 745f 696e 7465 7266 6163 655f 7369 676e 616c 7328 5b5d 2c20 5f2c 205b 5d29 2e0a 6765 6e5f 706f 7274 5f69 6e74
4316020  6572 6661 6365 5f73 6967 6e61 6c73 285b 706f 7274 2850 6f72 744e 616d 652c 5f2c 5479 7065 297c 506f 7274 735d 2c20 4e2c
4316100  0a09 2020 2020 2020 2020 2020 2020 2020 2020 205b 7369 676e 616c 5f64 6563 6c61 7261 7469 6f6e 2853 6967 6e61 6c4e
4316160  616d 652c 2054 7970 6529 7c53 6967 6e61 6c73 5d29 203a 2d0a 0963 6f6e 6361 745f 6174 6f6d 285b 6675 2c4e 2c50 6f72 744e
4316240  616d 655d 2c20 5369 676e 616c 4e61 6d65 292c 0a09 6765 6e5f 706f 7274 5f69 6e74 6572 6661 6365 5f73 6967 6e61 6c73 2850
4316320  6f72 7473 2c20 4e2c 2053 6967 6e61 6c73 292e 0a0a 2525 2525 2525 2525 2525 2525 2525 2525 2525 2525 2525 2525 2525 2525
4316400  2525 2525 2525 2525 2525 2525 2525 2525 2525 2525 2525 2525 2525 2525 2525 2525 2525 2525 2525 2525 2525 2525 2525 2525
4316460  2525 0a0a 6765 6e5f 7265 6769 7374 6572 5f73 6967 6e61 6c73 2852 6567 6973 7465 7253 6967 6e61 6c73 2920 3a2d 0a09 6669
4316540  6e64 616c 6c28 5369 676e 616c 2c20 7265 6769 7374 6572 285f 2c5f 2c53 6967 6e61 6c29 2c20 5369 676e 616c 7329 2c0a 096c
4316620  6973 745f 746f 5f73 6574 2853 6967 6e61 6c73 2c20 5369 676e 616c 5365 7429 2c0a 0967 656e 5f72 6567 6973 7465 725f 7369
4316700  676e 616c 5f64 6563 6c61 7261 7469 6f6e 2853 6967 6e61 6c53 6574 2c52 6567 6973 7465 7253 6967 6e61 6c73 292e 0a20 0a67
4316760  656e 5f72 6567 6973 7465 725f 7369 676e 616c 5f64 6563 6c61 7261 7469 6f6e 285b 5d2c 205b 5d29 2e0a 6765 6e5f 7265 6769
4317040  7374 6572 5f73 6967 6e61 6c5f 6465 636c 6172 6174 696f 6e28 5b53 6967 6e61 6c7c 5369 676e 616c 735d 2c0a 095b 7369 676e
4317120  616c 5f64 6563 6c61 7261 7469 6f6e 2853 6967 6e61 6c2c 2054 7970 6529 2c69 6e6c 696e 655f 636f 6d6d 656e 7428 6c69 7374
4317200  284e 616d 6573 2929 7c52 6573 745d 293a 2d0a 0966 696e 6461 6c6c 284e 616d 652c 2072 6567 6973 7465 7228 5f2c 4e61 6d65
4317260  2c53 6967 6e61 6c29 2c20 4e61 6d65 7329 2c0a 0972 6567 6973 7465 7228 5661 7249 642c 204e 616d 652c 2053 6967 6e61 6c29
4317340  2c21 2c0a 0967 6574 5f74 7970 6528 5661 7249 642c 2054 7970 6529 2c0a 0967 656e 5f72 6567 6973 7465 725f 7369 676e 616c
4317420  5f64 6563 6c61 7261 7469 6f6e 2853 6967 6e61 6c73 2c20 5265 7374 292e 0a09 0a67 6574 5f74 7970 6528 4964 2c20 5479 7065
4317500  2920 3a2d 0a09 6973 5f76 6172 6961 626c 6528 4964 2920 2d3e 2076 6172 6961 626c 655f 6964 2856 6172 2c20 4964 292c 6578
4317560  6973 7473 2856 6172 292c 0a09 2020 2020 2020 2020 2020 2020 2020 2020 2020 2076 6172 6961 626c 655f 7479 7065 2856 6172
4317640  2c20 5479 7065 290a 097c 2069 735f 636f 6e73 7461 6e74 2849 6429 202d 3e20 636f 6e73 7461 6e74 5f69 6428 436f 6e73 742c
4317720  2049 6429 2c65 7869 7374 7328 436f 6e73 7429 2c0a 0920 2020 2020 2020 2020 2020 2020 2020 2020 2020 2020 636f 6e73 7461
4320000  6e74 5f74 7970 6528 436f 6e73 742c 2054 7970 6529 0a20 2020 2020 2020 2020 207c 2069 735f 636f 6e74 726f 6c28 4964 2920 2d3e
4320060  2054 7970 6520 3d20 6269 740a 2020 2020 2020 2020 7c20 6f74 6865 7277 6973 6520 2d3e 2054 7970 6520 3d20 6269 742e 0a0a
4320140  2525 2525 2525 2525 2525 2525 2525 2525 2525 2525 2525 2525 2525 2525 2525 2525 2525 2525 2525 2525 2525 2525 2525 2525
4320220  2525 2525 2525 2525 2525 2525 2525 2525 2525 2525 2525 2525 2525 2525 2525 0a67 656e 5f73 7461 7465 5f73 6967 6e61 6c73
4320300  2873 6967 6e61 6c5f 6465 636c 6172 6174 696f 6e28 5b73 7461 7465 2c6e 6578 745f 7374 6174 655d 2c20 7374 6174 655f 7479
4320360  7065 2929 2e0a 2525 2525 2525 2525 2525 2525 2525 2525 2525 2525 2525 2525 2525 2525 2525 2525 2525 2525 2525 2525 2525
4320440  2525 2525 2525 2525 2525 2525 2525 2525 2525 2525 2525 2525 2525 2525 2525 2525 2525 2525 2525 0a0a 6765 6e5f 7374 7275 6374
4320520  7572 616c 5f63 6f6d 706f 6e65 6e74 7328 626c 6f53 6b5f 7374 6174 656d 656e 7428 2c61 6265 6c28 7374 7275 6374 7572 6529
4320600  2c20 5f2c 205b 512c 205b 5d2c 0a09 2020 2020 2020 2020 2020 2020 2020 2020 5374 7275 6374 7572 616c 436f 6d70 6f6e
4320660  656e 7473 2929 203a 2d0a 0967 6574 6462 5f63 7572 7265 6e74 2864 6573 6967 6e2c 4465 7369 676e 292c 0a09 6465 7369 676e
```

```
4320740  5f66 756e 6374 696f 6e5f 756e 6974 7328 4465 7369 676e 2c20 4675 6e63 7469 6f6e 556e 6974 7329 2c21 2c0a 0967 656e 5f66
4321020  755f 696e 7374 616e 6365 7328 4675 6e63 7469 6f6e 556e 6974 732c 2053 7472 7563 7475 7261 6c43 6f6d 706f 6e65 6e74 7329
4321100  2e0a 090a 6765 6e5f 6675 5f69 6e73 7461 6e63 6573 2846 756e 6374 696f 6e55 6e69 7473 2c20 5374 7275 6374 7572 616c 436f
4321160  6170 6f6e 656e 7473 2920 3a2d 0a09 6765 6e5f 6675 5f69 6e73 7461 6e63 6573 2846 756e 6374 696f 6e55 6e69 7473 2c20 312c
4321240  2053 7472 7563 7475 7261 6c43 6f6d 706f 6e65 6e74 7329 2e0a 0a67 656e 5f66 755f 696e 7374 616e 6365 7328 5b5d 2c20 5f2c
4321320  205b 5d29 2e0a 6765 6e5f 6675 5f69 6e73 7461 6e63 6573 285b 4655 7c46 5573 5d2c 204e 2c0a 095b 636f 6d70 6f6e 656e 745f
4321400  696e 7374 616e 7469 6174 696f 6e28 6c61 6265 6c28 4c61 6265 6c29 2c46 552c 706f 7274 5f6d 6170 2850 6f72 744d 6170 2929
4321460  7c52 6573 745d 293a 2d0a 0963 6f6d 706f 6e65 6e74 2046 552c 2050 6f72 7473 292c 2021 2c0a 0963 6f6e 6361 745f 6174 6f6d
4321540  285b 6675 2c4e 512c 4c61 6265 6c29 2c0a 0967 656e 5f69 6e74 6572 6661 6365 5f73 6967 6e61 6c5f 746f 5f70 6f72 745f 6d61
4321620  7073 2850 6f72 7473 2c20 4c61 6265 6c2c 2050 6f72 744d 6170 292c 0a09 4e65 7874 2069 7320 4e20 2b20 312c 0a09 6765 6e5f
4321700  6675 5f69 6e73 7461 6e63 6573 2846 5573 2c20 4e65 7874 2c20 5265 7374 292e 0a0a 6765 6e5f 696e 7465 7266 6163 655f 7369
4321760  676e 616c 5f74 6f5f 706f 7274 5f6d 6170 7328 5b5d 2c20 5f2c 205b 5d29 2e0a 6765 6e5f 696e 7465 7266 6163 655f 7369 676e
4322040  616c 5f74 6f5f 706f 7274 5f6d 6170 7328 5b70 6f72 7428 4e61 6d65 2c5f 2c5f 297c 506f 7274 735d 2c20 5072 6566 6978 2c0a
4322120  0920 2020 2020 2020 2020 2020 2020 2020 2020 2020 2020 2020 2020 205b 6173 736f 6369 6174 696f 6e28 4e61 6d65 2c53 6967
4322200  6e61 6c4e 616d 6529 7c50 6f72 744d 6170 5d29 203a 2d0a 0963 6f6e 6361 745f 6174 6f6d 285b 5072 6566 6978 2c20 4e61 6d65
4322260  5d2c 2053 6967 6e61 6c4e 616d 6529 2c0a 0967 656e 5f69 6e74 6572 6661 6365 5f73 6967 6e61 6c5f 746f 5f70 6f72 745f 6d61
4322340  7073 2850 6f72 7473 2c20 5072 6566 6978 2c20 506f 7274 4d61 7029 2e0a 0a25 2525 2525 2525 2525 2525 2525 2525 2525 2525
4322420  2525 2525 2525 2525 2525 2525 2525 2525 2525 2525 2525 2525 2525 2525 2525 2525 2525 2525 2525 2525 2525 2525 2525 2525
4322500  2525 2525 2525 2525 2525 250a 0a25 2525 2520 5072 6f63 6573 7320 6f66 2074 6865 2066 6f72 6d3a 0a25 2525 250a 2525 2525
4322560  2073 6574 5f73 7461 7465 3a0a 2525 2525 2020 2020 7072 6f63 6573 730a 2525 2525 2020 2020 6265 6769 6e0a 2525 2525 2020
4322640  2009 2020 2020 7761 6974 2075 6e74 696c 206e 6f74 2063 6c6b 2773 7461 626c 6520 616e 6420 636c 6b20 3d20 2731 273b 0a25
4322720  2525 2509 2020 2020 7374 6174 6520 3c3d 206e 6578 745f 7374 6174 653b 0a25 2525 2520 2020 2065 6e64 2070 726f 6365 7373
4323000  2073 6574 5f73 7461 7465 3b0a 0a67 656e 5f70 726f 6365 7373 5f73 6574 5f73 7461 7465 2870 726f 6365 7373 5f73 7461 7465
4323060  6d65 6e74 286c 6162 656c 2873 6574 5f73 7461 7465 292c 5f2c 5b5d 2c0a 0909 0920 2020 205b 7379 6e6f 7073 7973 5f77 6169
4323140  745f 7374 6174 656d 656e 7428 636c 6b29 2c0a 0909 0920 2020 2020 7369 676e 616c 5f61 7373 6967 6e6d 656e 7428 7374 6174
4323220  652c 206e 6578 745f 7374 6174 6529 5d29 292e 0a0a 2525 2525 2525 2525 2525 2525 2525 2525 2525 2525 2525 2525 2525 2525
4323300  2525 2525 2525 2525 2525 2525 2525 2525 2525 2525 2525 2525 2525 2525 2525 2525 2525 2525 2525 2525 2525 2525 2525 2525
4323360  2525 0a0a 6765 6e5f 7072 6f63 6573 735f 6173 7369 676e 5f72 6567 6973 7465 7273 2870 726f 6365 7373 5f73 7461 7465 6d65
4323440  6e74 286c 6162 656c 2861 7373 6967 6e5f 7265 6769 7374 6572 7329 2c5f 2c5b 5d2c 0a09 5b73 796e 6f70 7379 735f 7761 6974
4323520  5f73 7461 7465 6d65 6e74 2863 6c6b 297c 5265 6769 7374 6572 4173 7369 676e 6d65 6e74 735d 2929 203a 2d0a 0967 6574 6462
4323600  5f63 7572 7265 6e74 2864 6573 6967 6e2c 205f 4465 7369 676e 292c 0a09 6578 6973 7473 5f63 6f6e 7472 6f6c 5f73 7465 7073
4323660  2869 6428 702d 3329 2c20 5f2c 204e 292c 0a09 6f70 6572 6174 6f72 735f 696e 5f73 6368 6564 756c 6528 7363 6865 6475 6c65
4323740  2c20 5f2c 204e 2c20 4c69 7374 4f66 4f70 6572 6174 6f72 7329 2c0a 0967 656e 5f72 6567 6973 7465 725f 6173 7369 676e 6d65
4324020  6e74 7328 4c69 7374 4f66 4f70 6572 6174 6f72 732c 2052 6567 6973 7465 7241 7373 6967 6e6d 656e 7473 292e 0a0a 2525 2525
4324100  2067 656e 6572 6174 6520 6120 6c61 7267 6520 6361 7365 2073 7461 7465 6d65 6e74 2066 6f72 2072 6567 6973 7465 7220 7369
4324160  676e 616c 2061 7373 6967 6e6d 656e 7473 0a0a 6765 6e5f 7265 6769 7374 6572 5f61 7373 6967 6e6d 656e 7473 284c 6973 744f
4324240  664f 7065 7261 746f 7273 2c0a 0909 5b63 6173 655f 7374 6174 656d 656e 7428 7374 6174 652c 5b77 6965 6e28 7374 6174 6530
4324320  2c5b 496e 7075 7473 2c4f 7574 7075 7473 5d29 2c57 6865 6e4c 6973 745d 295d 293a 2d0a 0967 656e 5f69 6e70 7574 5f66 726f
4324400  6d5f 706f 7274 7328 496e 7075 7473 292c 0a09 6765 6e5f 6f75 7470 7574 5f74 6f5f 706f 7274 7328 4f75 7470 7574 7329 2c0a
4324460  0967 656e 5f72 6567 6973 7465 725f 6173 7369 676e 6d65 6e74 7328 4c69 7374 4f66 4f70 6572 6174 6f72 732c 2031 2c20 5768
4324540  656e 4c69 7374 292e 0a0a 0a67 656e 5f69 6e70 7574 5f66 726f 6d5f 706f 7274 7328 5b73 6967 6e61 6c5f 6173 7369 676e 6d65
4324620  6e74 2872 6567 312c 7829 2c0a 0909 2020 2020 2020 7369 676e 616c 5f61 7373 6967 6e6d 656e 7428 7265 6732 2c61 292c 0a09
4324700  0920 2020 2020 2073 6967 6e61 6c5f 6173 7369 676e 6d65 6e74 2872 6567 332c 7529 2c0a 0909 2020 2020 2020 7369 676e 616c
4324760  5f61 7373 6967 6e6d 656e 7428 7265 6734 2c64 7829 2c0a 0909 2020 2020 2020 7369 676e 616c 5f61 7373 6967 6e6d 656e 7428
4325040  7265 6737 2c79 6929 5d29 2e0a 0909 090a 0000 85bf b328 c458 0018 c45c 0000 0000 0019 92c0 0018 c47c 0022 2240 2823 2938
4325120  392f 3131 2f32 3120 6164 6470 6f72 7472 6179 2e70 6c09 3230 302e 3322 0009 0000 0018 9fbc 0100 2def 0000 85bf 0000 0004
4325200  0019 9370 0019 9370 0001 0089 0000 0000 000b 7e6e 7e70 7369 676e 616c 2000 0000 0000 0028 0018 9ff4 b27c b66c 0000 1277
4325260  7fff ffff 0007 e02d 0200 0db5 0100 32b5 0000 85bf 0000 315f 0000 85bf b328 0000 0019 933c 0000 0000 0019 9358 0016 1e70
4325340  2cac 0000 0002 438a 2ca0 0000 0000 0000 0000 0001 0018 3d60 0018 3d60 0002 438a 0019 9394 0018 3d6c 000a 7668 646c 5f75
4325420  6e74 6162 0000 0000 0002 6675 0000 0000 0018 a0c4 0019 93b8 000d ceb0 0000 0000 2c78 0028 0002 438a 44e8 0000 0100 85bf
4325500  6b48 41fc 0000 000b 4254 0000 0000 2b6f 239c 0000 0019 93f8 0019 71e0 0400 85df 0000 85bf 0000 0010 0018 cbec 0018 cbec
4325560  0001 0089 0000 0000 000c 7e6e 7e70 656c 7365 7e70 7e70 0038 000b 7e6e 7e70 7072 6f63 6573 7300 0000 2c78 0028 0002 438a
4325640  44e8 0000 0100 85c7 6b48 41fc 0000 000b 4254 0000 0000 2b6f 239c 0000 0019 9460 0019 7210 0400 85e7 0000 85bf 0000 0010
4325720  0018 cc98 0018 cc98 0001 0089 0000 0000 000d 7e6e 7e70 7e70 203c 3d20 7e70 3b00 2c78 0028 0002 438a 44e8 0000 0100 85cf
4326000  6b48 41fc 0000 0013 4254 0000 0000 308f 239c 0000 0019 93f8 000d 7e6e 7e70 656e 6420 626c 6f63 6b00 0019 7120 0100 85bf
```

| | | | | | | | | | | | | | | | | | | | | | | | | |
|---|---|---|---|---|---|---|---|---|---|---|---|---|---|---|---|---|---|---|---|---|---|---|---|---|
| 4326060 | 0000 | 3287 | 0000 | 0004 | 0019 | 960c | 0019 | 960c | 0041 | 0000 | 0300 | 0000 | 2c78 | 0028 | 0002 | 438a | 44e8 | 0000 | 0100 | 85d7 | 6b48 | 41fc | 0000 | 0013 |
| 4326140 | 4254 | 0000 | 0000 | 308f | 239c | 0000 | 0019 | 9460 | 2c78 | 001c | 0002 | 438a | 44e8 | 0000 | 0300 | 85df | 6b48 | 6b88 | 6bc8 | 22bc | 0019 | 93f8 | 0017 | 7b14 |
| 4326220 | 0000 | 0010 | 0019 | ea84 | 0000 | 0000 | 2c78 | 001c | 0002 | 438a | 44e8 | 0000 | 0300 | 85e7 | 6b48 | 6b88 | 6bc8 | 22bc | 0019 | 9460 | 000b | 4fc8 | 0700 | 85f7 |
| 4326300 | 0000 | 85bf | 0000 | 001c | 0019 | 95a0 | 0019 | 95e4 | 0001 | 0089 | 0000 | 0000 | 000c | 7668 | 646c | 5f6e | 6f70 | 5f74 | 6162 | 0000 | 2938 | 0028 | 0018 | cd30 |
| 4326360 | 5d10 | 0000 | 0200 | 0daf | 6580 | 0024 | 92e4 | 0024 | 9860 | 3050 | 3754 | 0018 | 0024 | 22bc | 0019 | 9558 | 27f0 | 0000 | 0018 | cd30 | 2ca0 | 0000 | 0000 | 0000 |
| 4326440 | 0000 | 0001 | 0019 | 9578 | 0018 | cd30 | 0002 | 438a | 0019 | 307c | 000b | 52bc | 0300 | 85ff | 0000 | 85bf | 0000 | 000c | 0018 | ce54 | 0018 | ce54 | 0001 | 0089 |
| 4326520 | 0000 | 0000 | 2954 | 0018 | 0002 | 438a | 3664 | 41c8 | 0000 | 000b | 239c | 0000 | 0008 | cebc | 000d | 6164 | 6470 | 6f72 | 7472 | 6179 | 2e70 | 6c00 | 2c78 | 0020 |
| 4326600 | 0002 | 438a | 35c8 | 43c0 | 0200 | 0daf | 4b8c | 0000 | 0000 | 3287 | 6b88 | 22bc | 0019 | 7130 | 0019 | 7150 | 0100 | 85c7 | 0000 | 3287 | 0000 | 0004 | 0019 | 964c |
| 4326660 | 0019 | 964c | 0041 | 0000 | 000c | 0000 | 2c78 | 0020 | 0002 | 438a | 35c8 | 43c0 | 0200 | 0daf | 4b8c | 0000 | 0000 | 3287 | 6b88 | 22bc | 0019 | 7160 | 0019 | 7180 |
| 4326740 | 0100 | 85cf | 0000 | 3287 | 0000 | 0004 | 0019 | 968c | 0019 | 968c | 0041 | 0000 | 0000 | 0000 | 2c78 | 0020 | 0002 | 438a | 35c8 | 43c0 | 0200 | 0daf | 4b8c | 0000 |
| 4327020 | 0000 | 3287 | 6b88 | 22bc | 0019 | 7190 | 0019 | 71b0 | 0100 | 85d7 | 0000 | 3287 | 0000 | 0004 | 0019 | 96cc | 0019 | 96cc | 0041 | 0000 | 0000 | 0000 | 2c78 | 0020 |
| 4327100 | 0002 | 438a | 35c8 | 43c0 | 0200 | 0daf | 4b8c | 0000 | 0000 | 3287 | 6b88 | 22bc | 0019 | 71c0 | 0019 | 93e8 | 0300 | 85df | 0000 | 3287 | 0000 | 000c | 0019 | 970c |
| 4327160 | 0019 | 970c | 0041 | 0000 | 0000 | 0000 | 2c78 | 0020 | 0002 | 438a | 3690 | 43c0 | 0200 | 0daf | 4b8c | 0000 | 0000 | 3287 | 6c08 | 22bc | 0019 | 71f0 | 0019 | 9450 |
| 4327240 | 0300 | 85e7 | 0000 | 3287 | 0000 | 000c | 0019 | 974c | 0019 | 974c | 0041 | 0000 | 0000 | 0000 | 2c78 | 0020 | 0002 | 438a | 3690 | 43c0 | 0200 | 0daf | 4b8c | 0000 |
| 4327320 | 0000 | 3287 | 6c08 | 22bc | 0019 | 7220 | 0012 | 7944 | 0100 | 8567 | 0000 | 3287 | 0000 | 0004 | 0019 | 97c0 | 0019 | 97c0 | 0001 | 0088 | 0000 | 0000 | 0005 | 2028 |
| 4327400 | 7e70 | 2900 | 0003 | 207e | 7000 | 50f0 | 0019 | 9cfc | 000b | 53f8 | 0100 | 8617 | 0000 | 3287 | 0000 | 0004 | 0019 | a054 | 0019 | a054 | 0001 | 0088 | 0000 | 0000 |
| 4327460 | 2cac | 0000 | 0002 | 438a | 2ca0 | 0000 | 0000 | 00fc | 0000 | 0021 | 0019 | 51a4 | 0019 | 5a0c | 0019 | 5a16 | 0019 | 600c | 0019 | 9dc0 | 0019 | 55b4 | 0000 | 0000 |
| 4327540 | 0011 | 7369 | 676e | 616c | 5f61 | 7373 | 6967 | 6e6d | 656e | 7400 | 0019 | 59c8 | 0000 | 0000 | 0021 | 7e6e | 7e70 | 6361 | 7365 | 207e | 7020 | 6973 | 7e70 | 7e70 |
| 4327620 | 7e70 | 7e6e | 7e70 | 656e | 6420 | 6361 | 7365 | 3b00 | 0012 | 7e6e | 7e70 | 7768 | 656e | 207e | 7020 | 3d3e | 7e70 | 7e70 | 0000 | 0000 | 001c | 2533 | 5720 | 2533 |
| 4327700 | 4d20 | 2564 | 2025 | 3032 | 633a | 2530 | 3269 | 3a25 | 3032 | 7320 | 2579 | 0038 | 001d | 7e6e | 7e70 | 6966 | 207e | 7020 | 7468 | 656e | 7e70 | 7e70 | 7e6e | 7e70 |
| 4327760 | 656e | 6420 | 6966 | 3b00 | 0018 | bbd8 | 0000 | 0000 | 0019 | 5500 | 0000 | 0000 | 0015 | 7e6e | 7e70 | 656c | 7369 | 6620 | 7e70 | 2074 | 6865 | 6e7e | 707e | 7000 |
| 4330040 | 0002 | 293b | 0000 | 0000 | 000f | 7772 | 6974 | 655f | 7668 | 646c | 5f6c | 6973 | 7400 | 0000 | 0015 | 46ec | 0100 | 86af | 0000 | 3287 | 0000 | 0004 | 0019 | 9d04 |
| 4330120 | 0019 | 9d04 | 0001 | 0088 | 0000 | 0000 | 0010 | 656e | 756d | 6572 | 6174 | 696f | 6e5f | 7479 | 7065 | 0000 | 0010 | 7e6e | 7e70 | 7479 | 7065 | 207e | 7020 | 6973 |
| 4330200 | 2028 | 0000 | 0018 | b06c | 0019 | 9890 | 0012 | 7e6e | 7e70 | 7479 | 7065 | 207e | 7020 | 6973 | 207e | 703b | 0000 | 0000 | 0015 | 7e6e | 7e70 | 7375 | 6274 | 7970 |
| 4330260 | 6520 | 7e70 | 2069 | 7320 | 7e70 | 3b00 | 0019 | 54b0 | 0000 | 0000 | 0019 | 5768 | 0019 | 994c | 000a | 287e | 7020 | 7e70 | 207e | 7029 | 0000 | 0000 | 0019 | 57b4 |
| 4330340 | 0000 | 0000 | 0019 | 57e8 | 0019 | 996c | 0004 | 2d2d | 7e6e | 0000 | 0012 | 2d2d | 2020 | 5469 | 746c | 653a | 7e32 | 307c | 7e70 | 7e6e | 0000 | 0000 | 0014 | 2d2d |
| 4330420 | 2020 | 4372 | 6561 | 7465 | 643a | 7e32 | 307c | 7e70 | 7e6e | 0000 | 0013 | 2d2d | 2020 | 4175 | 7468 | 6f72 | 3a7e | 3230 | 7c7e | 707e | 6e00 | 0000 | 0017 | 5061 |
| 4330500 | 7274 | 6974 | 696f | 6e65 | 7220 | 7665 | 7273 | 696f | 6e20 | 312e | 3000 | 0000 | 0011 | 2d2d | 2020 | 4e6f | 7465 | 3a7e | 3230 | 7c7e | 707e | 6e00 | 0020 | 7e6e |
| 4330560 | 7e70 | 7061 | 636b | 6167 | 6520 | 7e70 | 2069 | 737e | 707e | 707e | 6e7e | 7065 | 6e64 | 207e | 703b | 0000 | 0019 | a074 | 0019 | 9888 | 0004 | 7e70 | 2c20 | 0000 |
| 4330640 | 001f | 7e6e | 7e6e | 656e | 7469 | 7479 | 207e | 7020 | 6973 | 7e70 | 7e70 | 7e6e | 656e | 6420 | 7e70 | 3b7e | 6e00 | 0000 | 000b | 561c | 0100 | 8627 | 0000 | 3287 |
| 4330720 | 0000 | 0004 | 0019 | 6404 | 0019 | 6404 | 0001 | 0088 | 0000 | 0000 | 0002 | 7e70 | 0000 | 0000 | 000d | 7e6e | 7e70 | 706f | 7274 | 2028 | 207e | 7000 | 000b | 7668 |
| 4331000 | 646c | 5f74 | 6162 | 6966 | 7900 | 0000 | 000f | 7772 | 6974 | 655f | 706f | 7274 | 5f6c | 6973 | 7400 | 0000 | 0003 | 2029 | 3b00 | 0000 | 0016 | 4a84 | 0100 | 876f |
| 4331060 | 0000 | 3287 | 0000 | 0004 | 0019 | 9e10 | 0019 | 9e10 | 0001 | 0088 | 0000 | 0000 | 0017 | 636f | 6d70 | 6f6e | 656e | 745f | 696e | 7374 | 616e | 7469 | 6174 | 696f |
| 4331140 | 6e00 | 0000 | 000e | 7e6e | 7e70 | 7e70 | 3a20 | 7e70 | 207e | 703b | 0000 | 0000 | 000a | 706f | 7274 | 206d | 6170 | 2028 | 0000 | 0000 | 000b | 6173 | 736f | 6369 |
| 4331220 | 6174 | 696f | 6e00 | 0000 | 0019 | 5c94 | 0019 | 9804 | 0019 | 5a98 | 0000 | 0000 | 0019 | a01c | 0019 | 9c9c | 0017 | 7379 | 6e6f | 7073 | 7973 | 5f77 | 6169 | 745f |
| 4331300 | 7374 | 6174 | 656d | 656e | 7400 | 0000 | 000e | 696e | 6c69 | 6e65 | 5f63 | 6f6d | 6d65 | 6e74 | 0000 | 0000 | 0010 | 6375 | 7272 | 656e | 745f | 706f | 7369 | 7469 |
| 4331360 | 6f6e | 0000 | 0013 | 7668 | 646c | 5f63 | 6f6d | 6d65 | 6e74 | 5f63 | 6f6c | 756d | 6e00 | 0000 | 0012 | bda8 | 0100 | 87c7 | 0000 | 3287 | 0000 | 0004 | 0019 | 9f20 |
| 4331440 | 0019 | 9f20 | 0001 | 0088 | 0000 | 0000 | 0012 | bde0 | 0100 | 87cf | 0000 | 3287 | 0000 | 0004 | 000a | 18f0 | 0019 | 6610 | 0003 | 0088 | 0000 | 0000 | 0014 | 7e6e |
| 4331520 | 7e6e | 5573 | 6520 | 775f | 726b | 2e7e | 702e | 616c | 6c3b | 0000 | 28c4 | 0028 | 0019 | 5fac | 5d10 | 0000 | 0100 | 57ff | 671c | 4550 | 6b74 | 5370 | 4240 | 0000 |
| 4331600 | 0000 | 87df | 239c | 0000 | 0008 | c0fc | 0003 | 7e2a | 2b00 | 0000 | 28c4 | 0018 | 0019 | 5fdc | 5d10 | 0000 | 0100 | 8637 | 671c | 22bc | 0019 | 9a64 | 0019 | 9c30 |
| 4331660 | 0019 | 9b30 | 0016 | 4644 | 0100 | 8687 | 0000 | 3287 | 0000 | 0004 | 0019 | 64c0 | 0019 | 64c0 | 0001 | 0088 | 0000 | 0000 | 28c4 | 0018 | 0019 | 9cac | 5d10 | 0000 |
| 4331740 | 0100 | 8767 | 671c | 22bc | 0019 | 9c8c | 0012 | bb9c | 0100 | 8767 | 0000 | 3287 | 0000 | 0004 | 0019 | a02c | 0019 | a02c | 0001 | 0088 | 0000 | 0000 | 0018 | b988 |
| 4332020 | 0000 | 0000 | 0005 | 7e70 | 3a7e | 6e00 | 28c4 | 0018 | 0019 | 9ccc | 5d10 | 0000 | 0100 | 269f | 671c | 22bc | 0019 | 98dc | 0019 | 9cb8 | 0019 | 97e8 | 28c4 | 0012 |
| 4332100 | 0019 | 5a0c | 4e1c | 0000 | 0000 | 0007 | 2edc | 0000 | 0019 | 9520 | 0000 | 0010 | 0019 | ec1c | 0000 | 0000 | 27f0 | 0012 | 0019 | 9d28 | 4e1c | 0000 | 0000 | 0007 |
| 4332160 | 2edc | 0000 | 2cac | 0000 | 0002 | 438a | 2ca0 | 0000 | 0000 | 0000 | 0000 | 0001 | 0019 | 9cf0 | 0019 | 9d4c | 0018 | bd28 | 0019 | 979c | 28c4 | 0024 | 0019 | 9d4c |
| 4332240 | 56f8 | 671c | 5370 | 3050 | 4550 | 6b74 | 5370 | 41d4 | 0000 | 87ef | 239c | 0000 | 0008 | c0fc | 2954 | 0028 | 0002 | 438a | 56f8 | 671c | 682c | 3050 | 4550 | 6b74 |
| 4332320 | 5370 | 42ac | 0000 | 87f7 | 0008 | c0fc | 0010 | 2340 | 0019 | 98dc | 0019 | 9ab8 | 0200 | 876f | 0000 | 3287 | 0000 | 0008 | 0019 | 9dc8 | 0019 | 9dc8 | 0001 | 0088 |
| 4332400 | 0000 | 0000 | 000d | 6765 | 6e5f | 706b | 675f | 7479 | 7065 | 7300 | 0019 | 9ce4 | 0000 | 0010 | 0019 | e208 | 0000 | 0000 | 2c78 | 0012 | 0002 | 438a | 4e1c | 0000 |
| 4332460 | 0000 | 0007 | 2edc | 0000 | 2cac | 0000 | 0002 | 438a | 2ca0 | 0000 | 0000 | 0000 | 0000 | 0001 | 0019 | 9db4 | 0019 | 9db4 | 0002 | 438a | 0019 | 97e4 | 27f0 | 0024 |
| 4332540 | 0019 | 617c | 56f8 | 671c | 5370 | 3050 | 4550 | 6b74 | 5370 | 41d4 | 0000 | 87ef | 239c | 0000 | 0008 | c0fc | 2cac | 0000 | 0002 | 438a | 2ca0 | 0000 | 0000 | 0000 |
| 4332620 | 0000 | 0000 | 0019 | 9dec | 0019 | 617c | 0018 | acf0 | 0019 | 9e34 | 0000 | 0000 | 0011 | 7772 | 6974 | 655f | 626c | 6f63 | 6b5f | 6265 | 6769 | 6e00 | 0012 | 7e70 |
| 4332700 | 626c | 6f63 | 6b7e | 6e7e | 7062 | 6567 | 696e | 7e6e | 0000 | 0000 | 0012 | bf94 | 0100 | 8807 | 0000 | 3287 | 0000 | 0004 | 0019 | 61f4 | 0019 | 61f4 | 0001 | 0088 |
| 4332760 | 0000 | 0000 | 0019 | 9da8 | 0000 | 0010 | 0019 | ec98 | 0000 | 0000 | 000f | 7772 | 6974 | 655f | 626c | 6f63 | 6b5f | 656e | 6400 | 0000 | 0011 | 7e70 | 656e | 6420 |
| 4333040 | 626c | 6f63 | 6b20 | 7e70 | 3b7e | 6e00 | 000e | 7e70 | 656e | 6420 | 626c | 6f63 | 6b3b | 7e6e | 0000 | 0000 | 0012 | c008 | 0100 | 881f | 0000 | 3287 | 0000 | 0004 |
| 4333120 | 0019 | 627c | 0019 | 627c | 0001 | 0088 | 0000 | 0000 | 0019 | 9e88 | 0000 | 0010 | 0019 | eb54 | 0000 | 0000 | 0016 | 4764 | 0100 | 76ef | 0000 | 3287 | 0000 | 0004 |

```
4333200 001a 3820 001a 3820 0001 008c 0000 0000 2c78 0020 0002 438a 45c4 3280 24d0 0000 0008 bb9c 0014 37f0 3cf4 234c 0008 c89c
4333260 0013 6375 7272 656e 745f 696e 6465 6e74 6174 696f 6e00 0000 0010 7668 646c 5f69 6e64 656e 7461 7469 6f6e 0000 0012 c090
4333340 0100 8837 0000 3287 0000 0004 0019 6340 0019 6340 0001 0088 0000 0000 000a 6765 6e5f 656e 7469 7479 0000 0000 0012 c0c8
4333420 0100 883f 0000 3287 0000 0004 000a 18f0 0002 438a 0003 0088 0000 0000 000b 7668 646c 5f69 6e64 656e 7400 0000 000b 6765
4333500 6e5f 7061 636b 6167 6500 0000 0016 bd6c 0000 0008 0019 7670 000a 388c 0017 7b4c 0100 8847 0000 3287 0000 0004 000a 18f0
4333560 0019 663c 0003 0088 0000 0000 000a 6765 6e5f 6865 6164 6572 0000 0000 0000 858f b328 0000 0019 3118 0000 0000 2c78 0018
4333640 0002 438a 45b8 39a4 0019 9bac 0010 2340 0019 9f7c 0019 9ef4 0000 0010 0019 ee30 0000 0000 2c78 0010 0002 438a 239c 0000
4333720 0019 9f7c 2c78 0010 0002 438a 239c 0000 0012 ec68 0000 858f b328 0000 0019 30ec 0000 0000 000d 7772 6974 655f 7668 646c
4334000 2e70 6c00 0000 0028 0019 a09c b130 b66c 0000 12a1 7fff ffff 0019 6611 0200 0db5 0100 87cd 0000 0143 0000 315f 0019 a0c0
4334060 0000 0143 b328 0000 0019 a0a0 0000 0000 0000 0028 0019 a0d8 b130 b66c 0000 12a2 7fff ffff 0019 663d 0200 0db5 0100 8845
4334140 0000 0023 0000 315f 0019 a0fc 0000 0023 b328 0000 0019 a0dc 0000 0000 000e 6765 6e5f 636f 6d70 6f6e 656e 7473 0000 0000
4334220 0014 8c44 0000 0018 56f8 671c 5370 22bc 0019 c6f8 0019 c318 0009 7374 7275 6374 7572 6500 0008 6765 745f 7479 7065 0050
4334300 0015 2043 5055 2054 494d 4520 3d20 7e66 2073 6563 737e 6e00 0006 7374 6174 6530 0019 a174 0009 6765 6e5f 7479 7065 7300
4334360 0008 6f72 6469 6e61 7279 008c 0009 7379 6e74 6865 7369 7300 0019 c2d0 0000 2040 001a 410c 0019 a1b4 0000 000c 0019 d560
4334440 0019 a234 0000 0080 0019 d0dc 0019 d1b0 0019 d1c0 0019 ce74 0019 d23c 0019 d294 0019 d338 0019 d480 0019 cffd 0019 d470
4334520 0019 d52c 0000 0000 0000 0000 0000 0000 0000 0000 0000 0000 0000 0000 0000 0000 0000 0000 0000 0000 0000 0000 0000 0000
4334600 0000 0000 0019 d1f0 0019 cf1c 0019 cfb4 0019 cfec 0000 0000 0000 0000 0000 0000 0019 c39c 0000 1f88 656c 206f 7574 7075
4334660 7429 0a25 2525 2525 2525 2525 2525 2525 2525 2525 2525 2525 2525 2525 2525 2525 2525 2525 2525 2525 2525 2525 2525 2525
4334740 2525 2525 2525 2525 2525 2525 2525 2525 2525 2525 2525 2525 2525 2525 2525 0a3a 2d20 656e 7375 7265 5f6c 6f61 6465 6428
4335020 6c69 6272 6172 7928 6461 7465 2929 2e0a 3a2d 2065 6e73 7572 655f 6c6f 6164 6564 286c 6962 7261 7279 286c 6973 7473 2929
4335100 2e0a 3a2d 2065 6e73 7572 655f 6c6f 6164 6564 286c 6962 7261 7279 2861 6464 706f 7274 7261 7929 292e 0a25 2525 2525 2525
4335160 2525 2525 2525 2525 2525 2525 2525 2525 2525 2525 2525 2525 2525 2525 2525 2525 2525 2525 2525 2525 2525 2525 2525 2525
4335240 2525 2525 2525 2525 2525 2525 2525 2525 2525 2525 0a25 2525 2520 7573 6520 6f6e 6c79 2077 6865 6e20 7072 696e 7469 6e67
4335320 206f 7574 2076 6864 6c0a 2525 3a2d 2061 6464 5f70 6f72 7472 6179 2877 7269 7465 5f76 6864 6c29 2e0a 2525 2525 2525 2525
4335400 2525 2525 2525 2525 2525 2525 2525 2525 2525 2525 2525 2525 2525 2525 2525 2525 2525 2525 2525 2525 2525 2525 2525 2525
4335460 2525 2525 2525 2525 2525 2525 2525 2525 2525 2525 250a 2525 2525 2043 6f6e 6375 7272 656e 7420 5374 6174 656d 656e 7473
4335540 2948 616e 646c 6572 0a0a 2525 2525 2042 6c6f 636b 2053 7461 7465 6d65 6e74 0a0a 7772 6974 655f 7668 646c 2862 6c6f 636b
4335620 5f73 7461 7465 6d65 6e74 286c 6162 656c 284c 6162 656c 292c 2047 7561 7264 4578 7072 6573 7369 6f6e 2c0a 0920 2020 2020
4335700 2020 2020 2020 2020 2020 2020 2020 4865 6164 6572 2c20 4465 636c 6172 6174 696f 6e73 2c20 5374 6174 656d 656e 7473 2929
4335760 203a 2d0a 0928 6e6f 6e76 6172 284c 6162 656c 2920 2d3e 2066 6f72 6d61 7428 277e 6e7e 6e7e 703a 272c 205b 4c61 6265 6c5d
4336040 2920 3b20 7472 7565 292c 0a09 7668 646c 5f70 6f73 2854 6162 292c 0a09 666f 726d 6174 2827 7e6e 7e70 626c 6f63 6b27 2c20
4336120 5b76 6864 6c5f 7461 6228 5461 6229 5d29 2c0a 0928 6e6f 6e76 6172 2847 7561 7264 4578 7072 6573 7369 6f6e 2920 2d3e 2066
4336200 6f72 6d61 7428 2720 287e 7029 272c 205b 4775 6172 6445 7870 7265 7373 696f 6e5d 293b 7472 7565 292c 0a09 7772 6974 655f
4336260 7668 646c 2876 6864 6c5f 6e6f 705f 7461 6228 5f29 292c 0a09 7772 6974 655f 7668 646c 2848 6561 6465 7229 2c0a 0977 7269
4336340 7465 5f76 6864 6c28 4465 636c 6172 6174 696f 6e73 292c 0a09 666f 726d 6174 2827 7e6e 7e70 6265 6769 6e27 2c20 5b76 6864
4336420 6c5f 7461 6228 5461 6229 5d29 2c0a 0977 7269 7465 5f76 6864 6c28 7668 646c 5f6e 6f70 5f74 6162 285f 2929 2c0a 0977 7269
4336500 7465 5f76 6864 6c28 5374 6174 656d 656e 7473 292c 0a09 666f 726d 6174 2827 7e6e 7e70 656e 6420 626c 6f63 6b27 2c20 5b76
4336560 6864 6c5f 7461 6228 5461 6229 5d29 2c0a 0928 6e6f 6e76 6172 284c 6162 656c 2920 2d3e 2066 6f72 6d61 7428 2720 7e70 272c
4336640 205b 4c61 6265 6c5d 2920 3b20 7472 7565 292c 0a09 7072 696e 7428 273b 2729 2e0a 0a25 2525 2520 5072 6f63 6573 7320 5374
4336720 6174 656d 656e 740a 0a77 7269 7465 5f76 6864 6c28 7072 6f63 6573 735f 7374 6174 656d 656e 7428 6c61 6265 6c28 4c61 6265
4337000 6c29 2c0a 0909 0920 2020 2020 5365 6e73 6974 6976 6974 794c 6973 742c 0a09 0909 2020 2020 2050 726f 6365 7373 4465 636c
4337060 6172 6174 696f 6e73 2c0a 0920 2020 2020 2020 2020 2020 2020 2020 2020 5072 6f63 6573 7353 7461 7465 6d65 6e74
4337140 7329 2920 3a2d 0a09 286e 6f6e 7661 7228 4c61 6265 6c29 202d 3e20 666f 726d 6174 2827 7e6e 7e6e 7e70 3a27 2c20 5b4c 6162
4337220 656c 5d29 203b 2074 7275 6529 2c0a 0976 6864 6c5f 706f 7328 5461 6229 2c0a 0966 6f72 6d61 7428 277e 6e7e 7070 726f 6365
4337300 7373 272c 205b 7668 646c 5f74 6162 2854 6162 295d 292c 0a09 286e 6f6e 7661 7228 5365 6e73 6974 6976 6974 794c 6973 7429
4337360 202d 3e20 666f 726d 6174 2827 2028 7e70 2927 2c20 5b53 656e 7369 7469 7669 7479 4c69 7374 5d29 3b74 7275 6529 2c0a 0977
4337440 7269 7465 5f76 6864 6c28 7668 646c 5f6e 6f70 5f74 6162 285f 2929 2c0a 0977 7269 7465 5f76 6864 6c28 5072 6f63 6573 7344
4337520 6563 6c61 7261 7469 6f6e 7329 2c0a 0966 6f72 6d61 7428 277e 6e7e 7062 6567 696e 272c 205b 7668 646c 5f74 6162 2854 6162
4337600 295d 292c 0a09 7772 6974 655f 7668 646c 2876 6864 6c5f 6e6f 705f 7461 6228 5f29 292c 0a09 7772 6974 655f 7668 646c 2850
4337660 726f 6365 7373 5374 6174 656d 656e 7473 292c 0a09 666f 726d 6174 2827 7e6e 7e70 656e 6420 7072 6f63 6573 7327 2c20 5b76
4337740 6864 6c5f 7461 6228 5461 6229 5d29 2c0a 0928 6e6f 6e76 6172 284c 6162 656c 2920 2d3e 2066 6f72 6d61 7428 2720 7e70 272c
4340020 205b 4c61 6265 6c5d 2920 3b20 7472 7565 292c 0a09 7072 696e 7428 273b 2729 2e0a 0a25 2525 2525 2525 2525 2525 2525 2525
4340100 2525 2525 2525 2525 2525 2525 2525 2525 2525 2525 2525 2525 2525 2525 2525 2525 2525 2525 2525 2525 2525 2525 2525 2525
4340160 2525 2525 2525 2525 2525 2525 2525 0a25 2525 2520 5365 7175 656e 7469 616c 2053 7461 7465 6d65 6e74 7320 4861 6e64 6c65
4340240 720a 0a25 2525 2520 5369 676e 616c 2061 7373 6967 6e6d 656e 7420 7374 6174 656d 656e 7420 0a0a 7772 6974 655f 7668 646c
```

```
4340320 2873 6967 6e61 6c5f 6173 7369 676e 6d65 6e74 2854 6172 6765 742c 2045 7870 7265 7373 696f 6e29 2920 3a2d 0a09 7668 646c
4340400 5f70 6f73 2854 6162 292c 0a09 666f 726d 6174 2827 7e6e 7e70 7e70 203c 3d20 7e70 3b27 2c20 5b76 6864 6c5f 7461 6228 5461
4340460 6229 2c20 5461 7267 6574 2c20 4578 7072 6573 7369 6f6e 5d29 2e0a 0a25 2525 2520 4361 7365 2053 7461 7465 6d65 6e74 0a0a
4340540 7772 6974 655f 7668 646c 2863 6173 655f 7374 6174 656d 656e 7428 4578 7072 6573 7369 6f6e 2c20 416c 7465 726e 6174 6976
4340620 6573 4c69 7374 2929 203a 2d0a 0976 6864 6c5f 706f 7328 5461 6229 2c0a 0966 6f72 6d61 7428 277e 6e7e 7063 6173 6520 7e70
4340700 2069 737e 707e 707e 707e 6e7e 7065 6e64 2063 6173 653b 272c 0a09 095b 7668 646c 5f74 6162 2854 6162 292c 2045 7870 7265
4340760 7373 696f 6e2c 2076 6864 6c5f 6e6f 705f 7461 6228 5f29 2c20 7668 646c 5f6e 6f70 5f74 6162 285f 292c 0a09 0920 416c 7465
4341040 726e 6174 6976 6573 4c69 7374 2c20 7668 646c 5f74 6162 2854 6162 295d 292e 0a0a 7772 6974 655f 7668 646c 2877 6865 6e28
4341120 4368 6f69 6365 2c20 5374 6174 656d 656e 7473 2929 203a 2d0a 0966 6f72 6d61 7428 277e 6e7e 7077 6865 6e20 7e70 203d 3e7e
4341200 707e 7027 2c0a 0909 5b76 6864 6c5f 756e 7461 6228 5f29 2c20 4368 6f69 6365 2c20 7668 646c 5f6e 6f70 5f74 6162 285f 292c
4341260 2053 7461 7465 6d65 6e74 735d 292e 0a0a 2525 2525 2049 6620 5374 6174 656d 656e 7420 0a0a 7772 6974 655f 7669 646c 2869
4341340 665f 7374 6174 656d 656e 7428 436f 6e64 6974 696f 6e2c 2053 7461 7465 6d65 6e74 7329 2920 3a2d 0a09 7668 646c 5f70 6f73
4341420 2854 6162 292c 0a09 666f 726d 6174 2827 7e6e 7e70 6966 207e 7020 7468 656e 7e70 7e70 7e6e 7e70 656e 6420 6966 3b27 2c0a
4341500 0909 5b76 6864 6c5f 7461 6228 5461 6229 2c20 436f 6e64 6974 696f 6e2c 2076 6864 6c5f 6e6f 705f 7461 6228 5f29 2c0a 0909
4341560 2053 7461 7465 6d65 6e74 732c 2076 6864 6c5f 7461 6228 5461 6229 5d29 2e0a 0a77 7269 7465 5f76 6864 6c28 656c 7369 6628
4341640 436f 6e64 6974 696f 6e2c 2053 7461 7465 6d65 6e74 7329 2920 3a2d 0a09 666f 726d 6174 2827 7e6e 7e70 656c 7369 6620 7e70
4341720 2074 6865 6e7e 707e 7027 2c20 0a09 095b 7668 646c 5f75 6e74 6162 285f 292c 2043 6f6e 6469 7469 6f6e 2c20 7668 646c 5f6e
4342000 6f70 5f74 6162 285f 292c 2053 7461 7465 6d65 6e74 735d 292e 0a0a 7772 6974 655f 7668 646c 2865 6c73 6528 5374 6174 656d
4342060 656e 7473 2929 203a 2d0a 0966 6f72 6d61 7428 277e 6e7e 7065 6c73 657e 707e 7027 2c0a 0909 5b76 6864 6c5f 756e 7461 6228
4342140 5f29 2c20 7668 646c 5f6e 6f70 5f74 6162 285f 292c 2053 7461 7465 6d65 6e74 735d 292e 0a0a 2525 2525 2525 2525 2525 2525
4342220 2525 2525 2525 2525 2525 2525 2525 2525 2525 2525 2525 2525 2525 2525 2525 2525 2525 2525 2525 2525 2525 2525 2525 2525
4342300 2525 2525 2525 2525 2525 2525 2525 2525 250a 2525 2525 2044 6563 6c61 7261 7469 7665 2069 7465 6d73 2068 616e 646c 6572
4342360 0a0a 2525 2525 2053 6967 6e61 6c20 6465 636c 6172 6174 696f 6e0a 0a77 7269 7465 5f76 6864 6c28 7369 676e 616c 5f64 6563
4342440 6c61 7261 7469 6f6e 2853 6967 6e61 6c2c 2053 7562 7479 7065 496e 6469 6361 7469 6f6e 2929 203a 2d0a 0976 6864 6c5f 706f
4342520 7328 5461 6229 2c0a 0966 6f72 6d61 7428 277e 6e7e 7073 6967 6e61 6c20 272c 205b 7668 646c 5f74 6162 2854 6162 295d 292c
4342600 0a09 2869 735f 6c69 7374 2853 6967 6e61 6c29 202d 3e20 7772 6974 655f 7668 646c 5f6c 6973 7428 5369 676e 616c 2920 3b20
4342660 7772 6974 6528 5369 676e 616c 2929 2c0a 0966 6f72 6d61 7428 2720 3a20 7e70 3b27 2c20 5b53 7562 7479 7065 496e 6469 6361
4342740 7469 6f6e 5d29 2e0a 0a25 2525 2520 456e 756d 6572 6174 6564 2074 7970 6520 6465 636c 6172 6174 696f 6e2e 0a0a 7772 6974
4343020 655f 7668 646c 2874 7970 655f 6465 636c 6172 6174 696f 6e28 656e 756d 6572 6174 696f 6e5f 7479 7065 2c20 4e61 6d65 2c20
4343100 4465 6669 6e69 7469 6f6e 2929 203a 2d20 212c 0a09 7668 646c 5f70 6f73 2854 6162 292c 0a09 666f 726d 6174 2827 7e6e 7e70
4343160 7479 7065 207e 7020 6973 2020 272c 205b 7668 646c 5f74 6162 2854 6162 292c 204e 616d 655d 292c 0a09 7772 6974 655f 7668
4343240 646c 5f6c 6973 7428 4465 6669 6e69 7469 6f6e 292c 0a09 666f 726d 6174 2827 293b 272c 205b 5d29 2e0a 0a25 2525 2520 4f72
4343320 6469 6e61 7279 2074 7970 6520 6465 636c 6172 6174 696f 6e0a 0a77 7269 7465 5f76 6864 6c28 7479 7065 5f64 6563 6c61 7261
4343400 7469 6f6e 285f 2c20 4e61 6d65 2c20 5479 7065 4465 6669 6e69 7469 6f6e 2929 203a 2d0a 0976 6864 6c5f 706f 7328 5461 6229
4343460 2c0a 0966 6f72 6d61 7428 277e 6e7e 7074 7970 6520 7e70 2069 7320 7e70 3b27 2c20 5b76 6864 6c5f 7461 6228 5461 6229 2c20
4343540 4e61 6d65 2c20 5479 7065 4465 6669 6e69 7469 6f6e 5d29 2e0a 0a25 2525 2520 4f72 6469 6e61 7279 2073 7562 7479 7065 2064
4343620 6563 6c61 7261 7469 6f6e 0a0a 7772 6974 655f 7668 646c 2873 7562 7479 7065 5f64 6563 6c61 7261 7469 6f6e 285f 2c20 4e61
4343700 6d65 2c20 5479 7065 4465 6669 6e69 7469 6f6e 2929 203a 2d0a 0976 6864 6c5f 706f 7328 5461 6229 2c0a 0966 6f72 6d61 7428
4343760 277e 6e7e 7073 7562 7479 7065 207e 7020 6973 207e 703b 272c 205b 7668 646c 5f74 6162 2854 6162 292c 204e 616d 652c 2054
4344040 7970 6544 6566 696e 6974 696f 6e5d 292e 0a0a 2525 2525 2525 2525 2525 2525 2525 2525 2525 2525 2525 2525 2525 2525 2525
4344120 2525 2525 2525 2525 2525 2525 2525 2525 2525 2525 2525 2525 2525 2525 2525 2525 2525 2525 2525 2525 2525 2525 2525 250a
4344200 2525 2525 2045 7870 7265 7373 696f 6e20 6861 6e64 6c65 720a 0a25 2525 2520 4269 6e61 7279 206f 7065 7261 746f 7273 0a0a
4344260 7772 6974 655f 7668 646c 2865 7870 7228 4f70 2c20 4578 7072 312c 2045 7870 7232 2929 203a 2d0a 0966 6f72 6d61 7428 2728
4344340 7e70 207e 7020 7e70 2927 2c20 5b45 7870 7231 2c20 4f70 2c20 4578 7072 325d 292e 0a0a 2525 2525 2055 6e61 7279 206f 7065
4344420 7261 746f 7273 0a0a 7772 6974 655f 7668 646c 2865 7870 7228 4f70 2c20 4578 7072 2929 203a 2d0a 0966 6f72 6d61 7428 2728
4344500 7e70 207e 7029 272c 205b 4f70 2c20 4578 7072 5d29 2e0a 0a25 2525 2525 2525 2525 2525 2525 2525 2525 2525 2525 2525 2525
4344560 2525 2525 2525 2525 2525 2525 2525 2525 2525 2525 2525 2525 2525 2525 2525 2525 2525 2525 2525 2525 2525 2525 2525 2525
4344640 2525 2525 0a25 2525 2520 4d69 7363 656c 6c61 6e65 6f75 730a 0a25 2525 2520 4865 6164 6572 2066 6f72 2061 2056 4844 4c20
4344720 6669 6c65 206f 6620 7468 6520 666f 726d 0a2f 2a0a 2d2d 0a2d 2d20 2054 6974 6c65 3a20 0954 4553 545f 5254 4c0a 2d2d 2020
4345000 4372 6561 7465 643a 0957 6564 2046 6562 2032 3120 3136 3a34 303a 3031 2031 3939 300a 2d2d 2020 4175 7468 6f72 3a20 0956
4345060 696a 6179 204e 6167 6173 616d 790a 2d2d 0909 3c76 696a 6179 406f 7361 636c 3139 3e0a 2d2d 0a2d 2d20 204e 6f74 653a 2009
4345140 4120 7361 6d70 6c65 2052 542d 4c45 5645 4c20 6465 7369 676e 2e0a 2d2d 0a2a 2f0a 0a77 7269 7465 5f76 6864 6c28 6865 6164
4345220 6572 2854 6974 6c65 2c20 4e6f 7465 2929 203a 2d0a 0976 6964 6c5f 706f 7328 3029 2c0a 0974 696d 655f 7374 616d 7028 2725
4345300 3357 2025 334d 2025 6420 2530 3263 3a25 3032 693a 2530 3273 2025 7927 2c20 5469 6d65 292c 0a09 666f 726d 6174 2827 2d2d
4345360 7e6e 272c 205b 5d29 2c0a 0966 6f72 6d61 7428 272d 2d20 2054 6974 6c65 3a7e 3230 7c7e 707e 6e27 2c20 5b54 6974 6c65 5d29
```

```
4345440 2c0a 0966 6f72 6d61 7428 272d 2d20 2043 7265 6174 6564 3a7e 3230 7c7e 707e 6e27 2c20 5b54 696d 655d 292c 0a09 666f 726d
4345520 6174 2827 2d2d 2020 4175 7468 6f72 3a7e 3230 7c7e 707e 6e27 2c20 5b27 5061 7274 6974 696f 6e65 7220 7665 7273 696f 6e20
4345600 312e 3027 5d29 2c0a 0966 6f72 6d61 7428 272d 2d7e 6e27 2c20 5b5d 292c 0a09 666f 726d 6174 2827 2d2d 2020 4e6f 7465 3a7e
4345660 3230 7c7e 707e 6e27 2c20 5b4e 6f74 655d 292e 0a0a 2525 2525 2050 6163 6b61 6765 0a0a 7772 6974 655f 7668 646c 2870 6163
4345740 6b61 6765 5f64 6563 6c61 7261 7469 6f6e 284e 616d 652c 2044 6563 6c61 7261 7469 6f6e 7329 2920 3a2d 0a09 7668 646c 5f70
4346020 6f73 2854 6162 292c 0a09 666f 726d 6174 2827 7e6e 7e70 7061 636b 6167 6520 7e70 2069 737e 707e 707e 6e7e 7065 6e64 207e
4346100 703b 272c 0a09 2020 2020 2020 2020 5b76 6864 6c5f 7461 6228 5461 6229 2c20 4e61 6d65 2c20 7668 646c 5f6e 6f70 5f74 6162
4346160 285f 292c 0a09 0920 4465 636c 6172 6174 696f 6e73 2c20 7668 646c 5f74 6162 2854 6162 292c 204e 616d 655d 292e 0a09 0a77
4346240 7269 7465 5f76 6864 6c28 7061 636b 6167 655f 626f 6479 284e 616d 652c 2044 6563 6c61 7261 7469 6f6e 7329 2920 3a2d 0a09
4346320 7668 646c 5f70 6f73 2854 6162 292c 0a09 666f 726d 6174 2827 7e6e 7e6e 7e70 7061 636b 6167 6520 626f 6479 207e 7020 6973
4346400 7e70 7e70 7e6e 7e70 656e 6420 7e70 3b27 2c0a 0920 2020 2020 2020 205b 7668 646c 5f74 6162 2854 6162 292c 204e 616d 652c
4346460 2076 6864 6c5f 6e6f 705f 7461 6228 5f29 2c0a 0909 2044 6563 6c61 7261 7469 6f6e 732c 2076 6864 6c5f 7461 6228 5461 6229
4346540 2c20 4e61 6d65 5d29 2e0a 0a25 2525 2520 456e 7469 7479 0a0a 7772 6974 655f 7668 646c 2865 6e74 6974 795f 6465 636c 6172
4346620 6174 696f 6e28 4e61 6d65 2c20 506f 7274 436c 6175 7365 2929 203a 2d0a 0976 6864 6c5f 706f 7328 3029 2c0a 0966 6f72 6d61
4346700 7428 277e 6e7e 6e65 6e74 6974 7920 7e70 2069 737e 707e 707e 6e65 6e64 207e 703b 7e6e 272c 0a09 095b 4e61 6d65 2c20 7668
4346760 646c 5f6e 6f70 5f74 6162 285f 292c 2050 6f72 7443 6c61 7573 652c 204e 616d 655d 292e 0a0a 2525 2525 2041 7263 6869 7465
4347040 6374 7572 650a 0a77 7269 7465 5f76 6864 6c28 6172 6368 6974 6563 7475 7265 2841 7263 684e 616d 652c 2045 6e74 6974 794e
4347120 616d 652c 2041 7263 6844 6563 6c73 2c20 4172 6368 5374 6d74 7329 2920 3a2d 0a09 7668 646c 5f70 6f73 2830 292c 0a09 7668
4347200 646c 5f74 6162 2854 6162 292c 0a09 666f 726d 6174 2827 7e6e 6172 6368 6974 6563 7475 7265 207e 7020 6f66 207e 7020 6973
4347260 7e6e 7e70 7e70 7e6e 7e6e 6265 6769 6e7e 6e7e 707e 707e 6e7e 6e65 6e64 207e 703b 7e6e 272c 200a 0909 5b41 7263 684e 616d
4347340 652c 2045 6e74 6974 794e 616d 652c 0a09 0920 7668 646c 5f6e 6f70 5f74 6162 2854 6162 292c 2041 7263 6844 6563 6c73 2c0a
4347420 0909 2076 6864 6c5f 6e6f 705f 7461 6228 5461 6229 2c20 4172 6368 5374 6d74 732c 2041 7263 684e 616d 655d 292e 0a0a 2525
4347500 2525 2043 6f6d 706f 6e65 6e74 2064 6563 6c61 7261 7469 6f6e 2073 7461 7465 6d65 6e74 2e20 0a25 2525 2520 466f 726d 6174
4347560 3a0a 2525 2525 2020 2020 636f 6d70 6f6e 656e 7420 4144 440a 2525 2525 2020 2009 2020 2020 706f 7274 2028 2069 6e31 203a
4347640 2069 6e20 2069 6e74 3b0a 2525 2525 0920 2020 2020 2020 2020 2020 696e 3220 3a20 696e 2020 696e 743b 0a25 2525 2509 2020
4347720 2020 2020 2020 2020 2073 756d 203a 206f 7574 2069 6e74 2029 3b0a 2525 2525 2020 2020 656e 6420 636f 6d70 6f6e 656e 743b
4350000 0a0a 7772 6974 655f 7668 646c 2863 6f6d 706f 6e65 6e74 5f64 6563 6c61 7261 7469 6f6e 2843 6f6d 706f 6e65 6e74 4e61 6d65
4350060 2c20 506f 7274 436c 6175 7365 2929 203a 2d0a 0976 6864 6c5f 706f 7328 5461 6229 2c0a 0966 6f72 6d61 7428 277e 6e7e 7063
4350140 6f6d 706f 6e65 6e74 207e 707e 707e 707e 6e7e 7065 6e64 2063 6f6d 706f 6e65 6e74 3b27 2c0a 0909 5b76 6864 6c5f 7461 6228
4350220 5461 6229 2c20 436f 6d70 6f6e 656e 744e 616d 652c 2076 6864 6c5f 6e6f 705f 7461 6228 5f29 2c0a 0909 2050 6f72 7443 6c61
4350300 7573 652c 2076 6864 6c5f 7461 6228 5461 6229 5d29 2e0a 0a25 2525 2520 506f 7274 2063 6c61 7573 650a 2525 2525 2046 6f72
4350360 6d61 743a 0a25 2525 2520 2020 2070 6f72 7420 2820 5820 3a20 696e 2069 6e74 3b0a 2525 2525 2020 2020 2020 2020 2020 2043
4350440 4c4b 203a 2069 6e20 6269 743b 0a25 2525 2520 2020 2020 2020 2020 2020 596f 203a 206f 7574 2069 6e74 2029 3b0a 0a77 7269
4350520 7465 5f76 6864 6c28 706f 7274 5f63 6c61 7573 6528 506f 7274 7329 2920 3a2d 0a09 7668 646c 5f70 6f73 2854 6162 292c 0a09
4350600 666f 726d 6174 2827 7e6e 7e70 706f 7274 2028 207e 7027 2c20 5b76 6864 6c5f 7461 6228 5461 6229 2c20 7668 646c 5f74 6162
4350660 6966 7928 5f29 5d29 2c0a 0977 7269 7465 5f70 6f72 745f 6c69 7374 2850 6f72 7473 292c 0a09 666f 726d 6174 2827 2029 3b27
4350740 2c20 5b5d 292e 0a0a 2525 2525 2043 6f6d 706f 6e65 6e74 2069 6e73 7461 6e74 6961 7469 6f6e 2073 7461 7465 6d65 6e74 2e0a
4351020 0a77 7269 7465 5f76 6864 6c28 636f 6d70 6f6e 656e 745f 696e 7374 616e 7469 6174 696f 6e28 6c61 6265 6c28 4c61 6265 6c29
4351100 2c20 4e61 6d65 2c20 506f 7274 4d61 7029 2920 3a2d 0a09 7668 646c 5f70 6f73 2854 6162 292c 0a09 666f 726d 6174 2827 7e6e
4351160 7e70 7e70 3a20 7e70 207e 703b 272c 205b 7668 646c 5f74 6162 2854 6162 292c 204c 6162 656c 2c20 4e61 6d65 2c20 506f 7274
4351240 4d61 705d 292e 0a0a 7772 6974 655f 7668 646c 2870 6f72 745f 6d61 7028 5369 676e 616c 7329 2920 3a2d 0a09 7072 696e 7428
4351320 2770 6f72 7420 6d61 7020 2827 292c 0a09 7772 6974 655f 7668 646c 5f6c 6973 7428 5369 676e 616c 7329 2c0a 0970 7269 6e74
4351400 2827 2927 292e 0a0a 2525 2525 2041 7373 6f63 6961 7469 6f6e 2065 6c65 6d65 6e74 0a0a 7772 6974 655f 7668 646c 2861 7373
4351460 6f63 6961 7469 6f6e 2846 6f72 6d61 6c2c 2041 6374 7561 6c29 2920 3a2d 0a09 666f 726d 6174 2827 7e70 203d 3e20 7e70 272c
4351540 205b 466f 726d 616c 2c20 4163 7475 616c 5d29 2e0a 0a25 2525 2520 506f 7274 2069 6e74 6572 6661 6365 2073 6967 6e61 6c20
4351620 6465 636c 6172 6174 696f 6e20 0a0a 7772 6974 655f 7668 646c 2870 6f72 7428 5369 676e 616c 732c 2044 6972 6563 7469 6f6e
4351700 2c20 5479 7065 2929 203a 2d0a 0928 6973 5f6c 6973 7428 5369 676e 616c 7329 202d 3e20 7772 6974 655f 7668 646c 5f6c 6973
4351760 7428 5369 676e 616c 7329 3b70 7269 6e74 2853 6967 6e61 6c73 2929 2c0a 0966 6f72 6d61 7428 2720 3a20 7e70 207e 7027 2c20
4352040 5b44 6972 6563 7469 6f6e 2c20 5479 7065 5d29 2e0a 0a25 2525 2520 5379 6e6f 7073 7973 2077 6169 7420 7374 6174 656d 656e
4352120 740a 2525 2525 2046 6f72 6d61 743a 0a25 2525 2520 2009 7761 6974 2075 6e74 696c 206e 6f74 2063 6c6b 2773 7461 626c 6520
4352200 616e 6420 636c 6b20 3d20 2731 273b 0a0a 7772 6974 655f 7668 646c 2873 796e 6f70 7379 735f 7761 6974 5f73 7461 7465 6d65
4352260 6e74 2853 6967 6e61 6c29 2920 3a2d 0a09 7668 646c 5f70 6f73 2854 6162 292c 0a09 666f 726d 6174 2822 7e6e 7e70 7761 6974
4352340 2075 6e74 696c 206e 6f74 207e 7027 7374 6162 6c65 2061 6e64 207e 7020 3d20 2731 273b 222c 0a09 095b 7668 646c 5f74 6162
4352420 2854 6162 292c 2053 6967 6e61 6c2c 2053 6967 6e61 6c5d 292e 0a0a 2525 2525 2049 6e6c 696e 6520 436f 6d6d 656e 740a 0a77
4352500 7269 7465 5f76 6864 6c28 696e 6c69 6e65 5f63 6f6d 6d65 6e74 2843 6f6d 6d65 6e74 2929 203a 2d0a 096e 6f6e 7661 7228 436f
```

```
4352560 6d6d 656e 7429 202d 3e0a 0909 6375 7272 656e 745f 706f 7369 7469 6f6e 2843 7572 506f 7329 2c0a 0909 7668 646c 5f63 6f6d
4352640 6d65 6e74 5f63 6f6c 756d 6e28 436f 6d43 6f6c 292c 0a09 0928 4375 7250 6f73 203e 2043 6f6d 436f 6c20 2d3e 2043 6f6c 2069
4352720 7320 4375 7250 6f73 202b 2031 3b20 436f 6c20 6973 2043 6f6d 436f 6c29 2c0a 0909 666f 726d 6174 2827 7e2a 7c2d 2d20 7e70
4353000 272c 205b 436f 6c2c 2043 6f6d 6d65 6e74 5d29 0a09 3b20 7472 7565 2e0a 0a25 2525 2520 5573 6520 636c 6175 7365 0a0a 7772
4353060 6974 655f 7668 646c 2875 7365 5f63 6c61 7573 6528 5061 636b 6167 6529 2920 3a2d 0a09 666f 726d 6174 2827 7e6e 7e6e 5573
4353140 6520 776f 726b 2e7e 702e 616c 6c3b 272c 205b 5061 636b 6167 655d 292e 0a0a 2525 2525 2056 4844 4c20 5461 6220 616e 6420
4353220 556e 7461 6220 616e 6420 5461 6269 6679 0a0a 7772 6974 655f 7668 646c 2876 6864 6c5f 7461 6228 5461 6229 2920 3a2d 0a09
4353300 7668 646c 5f74 6162 2854 6162 292c 0a09 666f 726d 6174 2827 7e2a 2b27 2c5b 5461 625d 292e 0a0a 7772 6974 655f 7668 646c
4353360 2876 6864 6c5f 6e6f 705f 7461 6228 5461 6229 2920 3a2d 0a09 7668 646c 5f74 6162 2854 6162 292e 0a0a 7772 6974 655f 7668
4353440 646c 2876 6864 6c5f 756e 7461 6228 5461 6229 2920 3a2d 0a09 7668 646c 5f75 6e74 6162 2854 6162 292c 0a09 666f 726d 6174
4353520 2827 7e2a 2b27 2c5b 5461 625d 292e 0a0a 7772 6974 655f 7668 646c 2876 6864 6c5f 7461 6269 6679 2854 6162 2929 203a 2d0a
4353600 0976 6864 6c5f 7461 6269 6679 2854 6162 292e 0a0a 7772 6974 655f 7668 646c 286c 6973 7428 4c69 7374 2929 203a 2d0a 0977
4353660 7269 7465 5f76 6864 6c5f 6c69 7374 284c 6973 7429 2e0a 2525 2525 2525 2525 2525 2525 2525 2525 2525 2525 2525 2525 2525
4353740 2525 2525 2525 2525 2525 2525 2525 2525 2525 2525 2525 2525 2525 2525 2525 2525 2525 2525 2525 2525 2525 2525 2525 2525
4354020 2525 250a 2525 2525 2057 7269 7465 2061 206c 6973 7420 6f66 2076 6864 6c20 656c 656d 656e 7473 0a0a 7772 6974 655f 7668
4354100 646c 285b 5d29 203a 2d20 212e 0a77 7269 7465 5f76 6864 6c28 5b45 6c65 6d65 6e74 7c52 6573 745d 2920 3a2d 0a09 666f 726d
4354160 6174 2827 7e70 272c 205b 456c 656d 656e 745d 292c 212c 0a09 7772 6974 655f 7668 646c 2852 6573 7429 2e0a 0a25 2525 2525
4354240 2525 2525 2525 2525 2525 2525 2525 2525 2525 2525 2525 2525 2525 2525 2525 2525 2525 2525 2525 2525 2525 2525 2525 2525
4354320 2525 2525 2525 2525 2525 2525 2525 2525 2525 2525 2525 2525 0a25 2525 2520 5772 6974 6520 6120 272c 2720 7365 7061 7261
4354400 7465 6420 6c69 7374 206f 6620 7668 646c 2065 6c65 6d65 6e74 7320 6672 6f6d 2061 206c 6973 740a 0a77 0019 c234 0000 0020
4354460 45c4 3280 24d0 0000 0008 bb9c 0014 37f0 3cf4 234c 0016 4774 0017 7c2c 0200 8857 0000 3287 0000 0008 0019 da68 001a 3840
4354540 0001 008c 0000 0000 0014 6765 6e5f 7668 646c 5f64 6573 6372 6970 7469 6f6e 0000 0017 7c8c 0100 885f 0000 3287 0000 0004
4354620 001a 385c 001a 385c 0001 008c 0000 0000 0000 0000 0000 001c 2520 35c8 4300 0000 0000 5eef 0011 ffe4 000c c5a8 0017 7d1c
4354700 0100 8867 0000 3287 0000 0004 001a 3880 001a 3880 0001 008c 0000 0000 0019 22f4 0100 886f 0000 3287 0000 0004 001a 38c8
4354760 001a 38c8 0001 008c 0000 0000 0017 7e0c 0100 8877 0000 3287 0000 0004 001a 3930 001a 3930 0001 008c 0000 0000 0016 b3d4
4355040 0100 887f 0000 3287 0000 0004 001a 3960 001a 3960 0001 008c 0000 0000 0019 c39c 0000 004c 2ca0 0000 0000 0000 0000 0000
4355120 0019 32f4 0019 32f4 0019 32fe 0019 a134 0019 c35c 0000 0024 2ca0 0000 0000 0000 0000 0001 0019 33a0 0019 33a0 0002 438a
4355200 0019 c314 0019 c380 0012 c934 0100 8907 0000 3287 0000 0004 001a 3a10 001a 3a10 0001 008c 0000 0000 0016 b61c 0100 8897
4355260 0000 3287 0000 0004 001a 3900 001a 3900 0001 008c 0000 0000 000e 8610 0000 0028 2ca0 0000 0000 0000 0000 0000 0019 3404
4355340 0019 3404 0019 340e 0019 c37c 0019 c3c8 0013 6269 745f 7665 6374 6f72 2839 2074 6f20 3135 2900 0000 0019 c840 0000 0030
4355420 0019 c3f8 0000 0024 2ca0 0000 0000 0000 0000 0001 0019 347c 0019 347c 0002 438a 0019 c3c4 0019 c41c 0001 7500 0002 6478
4355500 0000 0000 0002 7969 0000 0000 0003 636c 6b00 0000 0003 6269 7400 0000 0002 796f 0000 0000 0019 c35c 0000 0028 2ca0 0000
4355560 0000 0000 0000 0001 0019 34e0 0019 34e0 0002 438a 0019 c418 0019 c4e4 000d 6765 6e5f 6172 6368 6e61 6d65 7300 000d 6765
4355640 6e5f 6172 6368 6465 636c 7300 000d 6765 6e5f 6172 6368 7374 6d74 7300 0013 a048 0000 0010 0019 eb8c 0000 0000 0012 c7c4
4355720 0200 88e7 0000 3287 0000 0008 0019 de80 0019 de80 0001 008c 0000 0000 0012 c838 0100 88ef 0000 3287 0000 0004 001a 39a0
4356000 001a 39a0 0001 008c 0000 0000 0012 c88c 0100 88f7 0000 3287 0000 0004 001a 39e0 001a 39e0 0001 008c 0000 0000 0019 c3f8
4356060 0000 0028 2ca0 0000 0000 0000 0000 0001 0019 3638 0019 3638 0002 438a 0019 c4e0 0019 c58c 0003 5254 4c00 0000 0019 c450
4356140 0000 0010 0019 e318 0000 0000 000b 6765 6e5f 7369 676e 616c 7300 0000 0019 a124 0000 0018 0019 e884 0000 0000 0019 c568
4356220 0000 0008 0012 c98c 0100 890f 0000 3287 0000 0004 0019 e0b4 0019 e0b4 0001 008c 0000 0000 0012 ca04 0100 8917 0000 3287
4356300 0000 0004 001a 3b18 001a 3b18 0001 008c 0000 0000 0019 c4c0 0000 0028 2ca0 0000 0000 0000 0000 0000 0019 375c 0019 375c
4356360 0019 3766 0019 c588 0019 c6c8 0019 6765 6e5f 7374 7275 6374 7572 616c 5f63 6f6d 706f 6e65 6e74 7300 0015 6765 6e5f 7072
4356440 6f63 6573 735f 7365 745f 7374 6174 6500 001c 6765 6e5f 7072 6f63 6573 735f 6173 7369 676e 5f72 6567 6973 7465 7273 0000
4356520 001b 6765 6e5f 7072 6f63 6573 735f 6375 5f61 6e64 5f62 696e 6469 6e67 7300 0000 0013 7e7c 0100 8b97 0000 3287 0000 0004
4356600 001a 440c 001a 440c 0001 0045 0000 0000 0012 ca64 0100 891f 0000 3287 0000 0004 001a 3c74 001a 3c74 0001 008c 0000 0000
4356660 0015 38cc 0100 8927 0000 3287 0000 0004 001a 3d4c 001a 3d4c 0001 008c 0000 0000 0012 caf4 0100 892f 0000 3287 0000 0004
4356740 001a 3d7c 001a 3d7c 0001 008c 0000 0000 0012 cb34 0100 8937 0000 3287 0000 0004 001a 3ee0 001a 3ee0 0001 008c 0000 0000
4357020 0019 c568 0000 0028 2ca0 0000 0000 0000 0000 0000 0019 37c0 0019 37c0 0019 37ca 0019 c6c4 0019 c730 000d 6765 6e5f 7374
4357100 6174 6574 7970 6500 0019 c4f0 0000 0010 0019 e748 0000 0000 0011 2ddc 0100 893f 0000 3287 0000 0004 001a 3a40 001a 3a40
4357160 0001 008c 0000 0000 0019 c6a4 0000 0028 2ca0 0000 0000 0000 0000 0000 0019 a120 0019 a120 0019 a12a 0019 c72c 0019 c7a8
4357240 000a 7374 6174 655f 7479 7065 0000 0000 000a 7374 7269 6e67 6c69 7374 0000 0000 0019 c6dc 0000 0010 0019 e688 0000 0000
4357320 0011 2f6c 0400 8957 0000 3287 0000 0010 0019 f440 0019 f440 0001 008c 0000 0000 0019 c70c 0000 0028 2ca0 0000 0000 0000
4357400 0000 0001 0019 3868 0019 3868 0002 438a 0019 c7a4 0019 c878 0015 6465 7369 676e 5f66 756e 6374 696f 6e5f 756e 6974 7300
4357460 000f 6765 6e5f 636f 6d70 6f6e 656e 7473 3100 0000 0019 c754 0000 0010 0013 1c84 0000 0000 0012 ec98 0200 895f 0000 3287
4357540 0000 0008 001a 3ac0 001a 3ac0 0001 008c 0000 0000 0012 ecb8 0200 8967 0000 3287 0000 0008 001a 3a80 001a 3a80 0001 008c
4357620 0000 0000 0019 c7d8 0000 0010 0013 1b88 0000 0000 0004 7274 6c68 0094 0019 c8b4 0000 003c 4e1c 0000 0000 0007 54a8 228c
```

```
4357700 0019 c8b4 0000 0024 2ca0 0000 0000 0000 0000 0001 0019 c83c 0019 3984 0019 398e 0019 c874 0019 c8f4 0015 b7ac 0200 527f
4357760 0000 3287 0000 0008 0019 f7c8 0019 f7c8 0001 008b 0000 0000 0013 6861 6c31 5f63 6f6e 7374 7261 696e 6564 2e70 6c00 0008
4360040 0019 cacc 0000 006c 0019 c8d0 0000 0014 4e1c 0000 0000 0007 54a8 228c 0019 c8f8 0000 0024 2ca0 0000 0000 0000 0000 0001
4360120 0019 c8b8 0019 c8f4 0019 c8fe 0019 c8f0 0019 c9f8 0019 c964 0000 0028 56f8 671c 682c 5758 6784 6a00 320c 247c 0015 aebc
4360200 0014 2ecc 2410 0000 0019 c7f4 0015 6765 6e5f 696e 7465 7266 6163 655f 7369 676e 616c 7300 0014 6765 6e5f 7265 6769 7374
4360260 6572 5f73 6967 6e61 6c73 0000 0011 6765 6e5f 7374 6174 655f 7369 676e 616c 7300 0019 c828 0000 0010 0013 1b50 0000 0000
4360340 0012 ecec 0100 896f 0000 3287 0000 0004 0019 e288 0019 e288 0001 008c 0000 0000 0012 ec58 0100 8977 0000 3287 0000 0004
4360420 0019 e42c 0019 e42c 0001 008c 0000 0000 0012 ed60 0100 897f 0000 3287 0000 0004 001a 3c44 001a 3c44 0001 008c 0000 0000
4360500 0019 c784 0000 0028 2ca0 0000 0000 0000 0000 0000 0019 369c 0019 369c 0019 36a6 0019 c9f4 0019 ca88 000c 6765 745f 6370
4360560 755f 7469 6d65 0000 0019 c970 0200 896f 0000 3287 0000 0008 001a 3b40 001a 3b40 0001 008c 0000 0000 0019 c510 0000 0018
4360640 3640 41e8 0000 000b 239c 0000 0019 ca50 0019 ca08 0300 896f 0000 3287 0000 000c 001a 3b60 001a 3b60 0001 008c 0000 0000
4360720 0019 c9d4 0000 0028 2ca0 0000 0000 0000 0000 0001 0019 36c8 0019 3b84 0019 3b8e 0019 ca84 0019 cb14 001a 6765 6e5f 706f
4361000 7274 5f69 6e74 6572 6661 6365 5f73 6967 6e61 6c73 0000 0000 0012 eeac 0300 8987 0000 3287 0000 000c 001a 3b90 001a 3b90
4361060 0001 008c 0000 0000 0019 cb94 0000 004c 0013 1a4c 0000 0000 0019 caf0 0000 0014 4e1c 0000 0000 0007 54f8 228c 0019 cb3c
4361140 0000 0024 2ca0 0000 0000 0000 0000 0001 0019 cad8 0019 3c00 0019 3c0a 0019 cb10 0019 cbcc 001f 6765 6e5f 7265 6769 7374
4361220 6572 5f73 6967 6e61 6c5f 6465 636c 6172 6174 696f 6e00 0000 0019 ca2c 0000 0018 0000 0000 0000 0000 0019 cb74 0000 0008
4361300 0012 edf8 0200 8997 0000 3287 0000 0008 001a 3bfc 001a 3bfc 0001 008c 0000 0000 0019 c964 0000 0010 0013 198c 0000 0000
4361360 0003 696e 3200 0000 0003 696e 3100 0000 0019 cc30 0000 003c 4e1c 0000 0000 0007 54a8 228c 0019 cc10 0000 0024 2ca0 0000
4361440 0000 0000 0000 0001 0019 cb90 0019 3d08 0019 3d12 0019 cbc8 0019 cc74 0012 3900 0300 5357 0000 3287 0000 000c 000a 18f0
4361520 000b 8420 0003 008d 0000 0000 0012 ee54 0200 899f 0000 3287 0000 0008 0019 e570 0019 e570 0001 008c 0000 0000 0019 cb74
4361600 0000 0010 0013 1928 0000 0000 000a 6e65 7874 5f73 7461 7465 0000 0000 0019 ccbc 0000 0048 0013 1888 0000 0000 0019 cc48
4361660 0000 0008 0019 cc50 0000 0008 0019 cc8c 0000 0024 2ca0 0000 0000 0000 0000 0001 0019 3eac 0019 3eac 0002 438a 0019 cc70
4361740 0019 cce0 0010 6765 6e5f 6675 5f69 6e73 7461 6e63 6573 0000 0019 cc10 0000 0010 0013 1850 0000 0000 0012 ef90 0200 89b7
4362020 0000 3287 0000 0008 001a 3ca4 001a 3ca4 0001 009c 0000 0000 0019 cd2c 0000 0050 2ca0 0000 0000 0000 0000 0001 0019 3f10
4362100 0019 3f10 0002 438a 0019 ccdc 0019 cd64 0019 ccf4 0000 0010 0013 17d8 0000 0000 0019 cd2c 0000 0018 3640 41e8 0000 000b
4362160 239c 0000 0019 cd18 0019 cc98 0300 89b7 0000 3287 0000 000c 001a 3cd8 001a 3cd8 0001 008c 0000 0000 0019 cdac 0000 003c
4362240 4e1c 0000 0000 0007 54f8 228c 0019 cdac 0000 0024 2ca0 0000 0000 0000 0000 0001 0019 cd28 0019 3fd0 0019 3fda 0019 cd60
4362320 0019 cdf4 0021 6765 6e5f 696e 7465 7266 6163 655f 7369 676e 616c 5f74 6f5f 706f 7274 5f6d 6170 7300 0012 efb0 0300 89bf
4362400 0000 3287 0000 000c 001a 3d1c 001a 3d1c 0001 008c 0000 0000 0019 cfb8 0000 0084 0013 17a0 0000 0000 0019 cdd0 0000 0014
4362460 4e1c 0000 0000 0007 54f8 228c 0019 cdf8 0000 0024 2ca0 0000 0000 0000 0000 0001 0019 cdb8 0019 408c 0019 4096 0019 cdf0
4362540 0019 ce2c 0019 ce08 0000 0010 0013 1768 0000 0000 0019 cec8 0000 0024 2ca0 0000 0000 0000 0000 0001 0019 410c 0019 410c
4362620 0002 438a 0019 ce28 0019 ceec 0010 6173 7369 676e 5f72 6567 6973 7465 7273 0000 0014 6578 6973 7473 5f63 6f6e 7472 6f6c
4362700 5f73 7465 7073 0000 0018 6765 6e5f 7265 6769 7374 6572 5f61 7373 6967 6e6d 656e 7473 0000 000b 636c 6561 725f 7374 6163
4362760 6b00 0000 0012 f01c 0300 89cf 0000 3287 0000 000c 0019 a064 0019 a064 0001 008c 0000 0000 0011 33c0 0200 89d7 0000 3287
4363040 0000 0008 0019 ea10 0019 ea10 0001 008c 0000 0000 0019 ca64 0000 0028 2ca0 0000 0000 0000 0000 0001 0019 41a0 0019 41a0
4363120 0002 438a 0019 cee8 0019 cfec 0014 6765 6e5f 696e 7075 745f 6672 6f6d 5f70 6f72 7473 0000 0013 6765 6e5f 6f75 7470 7574
4363200 5f74 6f5f 706f 7274 7300 0000 0019 cc8c 0000 0010 0013 1730 0000 0000 0012 f0b4 0100 89df 0000 3287 0000 0004 001a 3db4
4363260 001a 3db4 0001 008c 0000 0000 0012 f0d4 0100 89e7 0000 3287 0000 0004 001a 3e08 001a 3e08 0001 008c 0000 0000 0019 cea4
4363340 0300 89d7 0000 3287 0000 000c 001a 3e4c 001a 3e4c 0001 008c 0000 0000 0004 7265 6731 0000 0004 7265 6732 0000 0004 7265
4363420 6733 0000 0004 7265 6734 0000 0004 7265 6737 0000 0019 d010 0000 0048 0013 16f8 0000 0000 0019 cff0 0000 0024 2ca0 0000
4363500 0000 0000 0000 0000 0019 430c 0019 430c 0019 4316 0019 cfe8 0019 d05c 0019 d010 0000 0010 0013 1688 0000 0000 0002 6f31
4363560 0000 0000 0005 6675 6d61 7000 0019 d0fc 0000 008c 56f8 671c 5370 5aec 0200 8667 4b8c 0000 0000 88df 4b8c 0000 0000 8a0f
4363640 228c 0000 0019 d060 0000 0024 2ca0 0000 0000 0000 0000 0000 0019 d00c 0019 d00c 0019 d016 0019 d058 0019 d098 0019 d074
4363720 0000 0014 4e1c 0000 0000 0007 54f8 228c 0019 d0f0 0000 0024 2ca0 0000 0000 0000 0000 0001 0019 d05c 0019 4414 0019 441e
4364000 0019 d094 0019 d138 001f 6765 6e5f 7265 6769 7374 6572 5f73 6967 6e61 6c5f 6173 7369 676e 6d65 6e74 7300 0000 0012 f2a4
4364060 0200 8a17 0000 3287 0000 0008 001a 3ea0 001a 3ea0 0001 008c 0000 0000 0200 61bf b464 0010 000b 83d8 001a 4274 0019 d2c8
4364140 0000 004c 0019 d100 0000 0008 0019 d114 0000 0014 4e1c 0000 0000 0007 54a8 228c 0019 d1f4 0000 0024 2ca0 0000 0000 0000
4364220 0000 0001 0019 d0fc 0019 44a4 0019 44ae 0019 d134 0019 d294 0018 6f70 6572 6174 6f72 5f6f 7574 7075 745f 7265 6769 7374
4364300 6572 0000 0016 6f70 6572 6174 6f72 5f6f 7574 7075 745f 7369 676e 616c 0000 0000 0011 3768 0300 8a1f 0000 3287 0000 000c
4364360 0019 e1d0 0019 e1d0 0001 008c 0000 0000 0017 9f4c 0200 8a27 0000 3287 0000 0008 0019 edc4 0019 edc4 0001 008c 0000 0000
4364440 0019 28d0 0200 83bf 0000 3287 0000 0008 0013 15ac 0019 d580 0001 0045 0000 0000 0017 9f84 0300 8a2f 0000 3287 0000 000c
4364520 000a 18f0 000b 7174 0003 008d 0000 0000 0000 0000 0000 0020 0013 13a4 0000 0000 0019 d270 0000 0019 239c 0000 0012 ec68
4364600 000f 6375 5f61 6e64 5f62 696e 6469 6e67 7300 0000 0013 6765 6e5f 6375 5f61 6e64 5f62 696e 6469 6e67 7300 0000 0200 61bf
4364660 b464 0010 000b 712c 000a 2d90 0013 36cc 0200 8a3f 0000 3287 0000 0008 0019 ef4c 0019 ef4c 0001 008c 0000 0000 0019 cec8
4364740 0000 0028 2ca0 0000 0000 0000 0000 0001 0019 46f0 0019 46f0 0002 438a 0019 d290 0019 d300 2c78 0010 0002 438a 320c 22bc
```

```
4365020  001a 40ac 0019 d24c 0300 8a3f 0000 3287 0000 000c 001a 3f2c 001a 3f54 0001 008c 0000 0000 0019 d34c 0000 003c 4e1c 0000
4365100  0000 0007 54f8 228c 0019 d34c 0000 0024 2ca0 d6ac 0000 0000 0000 0001 0019 d2c4 0019 480c 0019 4816 0019 d2fc 0019 d384
4365160  0014 6765 6e5f 6375 5f61 6e64 5f62 696e 6469 6e67 7331 0058 0017 a02c 0200 8a47 0000 3287 0000 0008 001a 3fa0 001a 3fa0
4365240  0001 008c 0000 0000 0000 8abf b328 f410 0019 d8a0 0000 0000 0019 d438 0000 003c 4e1c 0000 0000 0007 54a8 228c 0019 d438
4365320  0000 0024 2ca0 d964 0000 0000 0000 0001 0019 d348 0019 489c 0019 48a6 0019 d380 0019 d470 001a 6f70 6572 6174 6f72 5f69
4365400  6e70 7574 5f61 7373 6967 6e6d 656e 7473 0019 d5b4 001b 6f70 6572 6174 6f72 5f6f 7574 7075 745f 6173 7369 676e 6d65 6e74
4365460  7300 0000 0017 a04c 0400 8a4f 0000 3287 0000 0010 001a 4048 001a 4048 0001 008c 0000 0000 0017 a06c 0300 8a57 0000 3287
4365540  0000 000c 001a 3fec 001a 3fec 0001 008c 0000 0000 0018 b158 0300 8a5f 0000 3287 0000 000c 0019 d730 0019 d730 0001 008c
4365620  0000 0000 0000 8a87 b328 0000 0019 73a0 0000 0000 0019 d494 0000 003c 4e1c 0000 0000 0007 54f8 228c 0019 d494 0000 0024
4365700  2ca0 8aec 0000 0000 0000 0001 0019 d434 0019 49b8 0019 49c2 0019 d46c 0019 d4cc 0000 8abf b328 0000 0019 d874 0000 0000
4365760  000d 636f 6d70 6f6e 656e 7473 2e70 6c00 0019 d5a8 0000 005c 4e1c 0000 0000 0007 5548 2edc 0019 d4d0 0000 0024 2ca0 0007
4366040  0000 0000 0000 0001 0019 d490 0019 d4cc 0019 d4e0 0019 d4c8 001a 410c 0019 d4e4 0000 0014 56f8 5fa0 671c 22bc 0019 d3d4
4366120  0019 d540 0000 000c 0019 4a76 000b 7374 7269 6e67 6c69 7374 3100 37ff 0000 8a87 b328 1fc7 0019 7374 0000 0000 0018 bc18
4366200  0400 8a67 0000 3287 0000 0010 001a 40bc 0019 f4b0 0001 008c 0000 0000 000a 636f 6d70 6f6e 656e 7473 0000 0000 0016 bd44
4366260  0000 0024 48f8 5818 6750 5370 3050 4580 6b48 5370 4538 6bc8 6c34 22bc 0015 366c 0007 6465 7369 676e 3100 a198 27f0 0014
4366340  001a 3ae8 4e1c 0000 0000 0007 54a8 228c 2954 000c 0002 438a 48f8 2edc 27f0 0014 0019 e3a4 4e1c 0000 0000 0007 54f8 228c
4366420  0000 0000 0019 d770 0000 0174 0019 d580 0019 d5c0 0000 000c 0019 d5a4 0019 d5cc 0000 000c 0019 d5b0 0019 d5d8 0000 000c
4366500  0019 d5bc 0019 d5e4 0000 000c 0019 d5c8 0019 d5f0 0000 000c 0019 d5d4 0019 d5fc 0000 000c 0019 d5e0 0019 d608 0000 000c
4366560  0019 d5ec 0019 d614 0000 000c 0019 d5f8 0019 d620 0000 000c 0019 d604 0019 d62c 0000 000c 0019 d610 0019 d638 0000 000c
4366640  0019 d61c 0019 d644 0000 000c 0019 d628 0019 d650 0000 000c 0019 d634 0019 d65c 0000 000c 0019 d640 0019 d668 0000 000c
4366720  0019 a15c 0019 d674 0000 000c 0019 a150 0019 d680 0000 000c 0019 d664 0019 d68c 0000 000c 0019 d670 0019 d698 0000 000c
4367000  0019 d67c 0019 d6a4 0000 000c 0019 d688 0019 d6b0 0000 000c 0019 d694 0019 d6bc 0000 000c 0019 d6a0 0019 d6c8 0000 000c
4367060  0019 d5ac 0019 d6d4 0000 000c 0018 a478 0019 d5e0 0000 000c 0019 d6c4 0019 d6ec 0000 000c 0019 d6d0 0019 d6f8 0000 000c
4367140  0019 d6dc 0019 d704 0000 000c 0019 d6e8 0019 d710 0000 000c 0018 be18 0019 d770 0000 000c 0019 d79c 29c8 d710 0019 d724
4367220  0019 f3ce 2b24 d71c 0002 438a 001a 407a 2c78 000c 0002 438a 54f8 228c 29c8 d734 0019 d748 0019 f0d2 2b24 d740 0002 438a
4367300  0019 f1a6 0006 7374 6174 6534 0019 d760 0006 7374 6174 6531 0019 d76c 0019 d7c4 0000 0048 0000 0000 0019 d788 0000 000c
4367360  0000 0000 0019 d794 0000 000c 0000 0000 0019 d7a0 0000 000c 0019 d784 0019 d7ac 0000 000c 0019 d700 0019 d7c4 0000 000c
4367440  0000 0000 0006 7274 6c2e 706c 0019 d7c0 0019 d8d8 0000 002c b288 b66c 0000 132b 7fff ffff 0019 f818 0200 0db5 0100 15ad
4367520  0100 33fd 0000 000b 0000 315f 0037 2f68 6f6d 652f 6f73 6173 312f 612f 7669 6a61 792f 5648 444c 2f70 6172 7365 722f 7072
4367600  6f6c 6f67 2f6e 6577 6e65 772f 7633 2e31 2f72 746c 6800 2c20 003a 2f68 6f6d 652f 6f73 6173 312f 612f 7669 6a61 792f 5648
4367660  444c 2f70 6172 7365 722f 7072 6f6c 6f67 2f6e 6577 6e65 772f 7633 2e31 2f72 746c 682e 706c 0025 2525 0000 002c 000a 2a28
4367740  b27c b66c 0000 132e 7fff ffff 0019 7370 0200 0db5 0200 2f35 0000 8abf 0000 0463 0000 315f 0000 002c 000a 2a54 b27c b66c
4370020  0000 1365 7fff ffff 0019 739c 0200 0db5 0200 224d 0000 8abf 0000 3287 0000 315f 0010 6861 6c31 5f63 6f6e 7374 7261 696e
4370100  6564 0000 0019 da34 0000 0120 b27c b66c 0000 1330 0000 1364 000a d16d 0200 0db5 0200 270d 0000 8abf 0000 3287 0000 315f
4370160  0019 d930 0000 002c b130 b66c 0000 1331 0000 1397 0019 d935 0200 0db5 0200 2885 0000 0453 0000 0463 0000 315f 0019 d95c
4370240  0000 002c b4f0 b4e4 0000 1330 7fff ffff 0008 cc5d 0000 0000 0000 0000 0019 d908 0002 438a 0019 f80c 0019 d994 0000 0038
4370320  b27c b66c 0000 1332 0000 1366 0019 d9c4 0200 0db5 0500 1cdd 0000 76ef 0000 000b 0000 3287 00cc f883 0000 0463 0000 315f
4370400  0019 d9c0 0000 002c b4f0 b4e4 0000 1331 7fff ffff 0008 b0dd 0000 0000 0000 0000 0019 f480 0002 438a 001a 4180 0019 da34
4370460  0000 0038 b27c b66c 0000 1333 0000 1367 0019 da38 0200 0db5 0500 1cdd 0000 76ef 0000 0013 0000 3287 00b2 3ba3 0000 0463
4370540  0000 315f 2c78 003c 0002 438a 45b8 3574 332c 247c 0019 c1e8 0014 42ac 0000 8567 0019 94c8 0014 3d30 3b4c 0000 0008 d65c
4370620  000c 41d4 0000 8567 242c 0000 0019 963c 0019 daa0 0000 0038 b27c b66c 0000 1334 0000 1368 0019 daa4 0200 0db5 0500 1cdd
4370700  0000 8857 0000 0013 0000 3287 00ce 0f43 0000 0463 0000 315f 27f0 0034 001a 3840 45b8 46ec 37dc 42ac 0000 5eef 0011 ffa0
4370760  0014 39f8 0019 c220 0010 2ecc 37dc 41d4 0000 5eef 242c 0000 0011 ffe4 0019 db10 0000 0038 b27c b66c 0000 1335 0000 1369
4371040  0019 db14 0200 0db5 0500 1cdd 0000 885f 0000 000b 0000 3287 00ce 1103 0000 0463 0000 315f 2c78 0038 0002 438a 56f8 671c
4371120  55f0 6854 55f0 6a00 55f0 69b0 5370 247c 0019 c25c 0018 3a4c 0019 c27c 0014 39f8 0019 c29c 0010 2340 0019 c2bc 0019 db74
4371200  0000 0038 b27c b66c 0000 1336 0000 136a 0019 db78 0200 0db5 0500 1cdd 0000 8867 0000 000b 0000 3287 00ce 12e3 0000 0463
4371260  0000 315f 2c78 002c 0002 438a 5d10 0000 0200 86f7 6840 4af8 0000 8887 3280 247c 0012 73ec 0014 37f0 3cf4 234c 0012 bc4c
4371340  0019 dbec 0000 0038 b27c b66c 0000 1337 0000 136b 0019 dbf0 0200 0db5 0500 1cdd 0000 886f 0000 000b 0000 3287 00ce 13e3
4371420  0000 0463 0000 315f 2c78 0040 0002 438a 56f8 6044 5d10 0000 0200 59a7 4b8c 0000 0000 888f 55f0 671c 5370 5758 6750 5370
4371500  5d7c 0000 0100 57ff 4b8c 0000 0000 888f 239c 0000 0019 c348 0019 dc50 0000 0038 b27c b66c 0000 1338 0000 136c 0019 dc54
4371560  0200 0db5 0500 1cdd 0000 8897 0000 000b 0000 3287 00ce 1a43 0000 0463 0000 315f 2c78 002a 0002 438a 5d10 0000 0300 57c7
4371640  4b8c 0000 0000 899f 4b8c 0000 0000 88a7 4b8c 0000 0000 88af 228c fb94 0019 dda8 0000 0038 b27c b66c 0000 1339 0000 136d
4371720  0019 ddac 0200 0db5 0500 1cdd 0000 8877 0000 000b 0000 3287 00ce 14e3 0000 0463 0000 315f 2c78 011e 0002 438a 5d10 0000
4372000  0200 599f 4b8c 0000 0000 30b7 5a18 0000 0100 581f 55f0 6160 5d7c 0000 0300 5337 4b8c 0000 0000 5567 4b8c 0000 0000 24c7
4372060  4b8c 0000 0000 88a7 56f8 6160 5d7c 0000 0300 5337 4b8c 0000 0000 1c77 4b8c 0000 0000 24c7 4b8c 0000 0000 88a7 56f8 6160
```

| | | | | | | | | | | | | | | | | | | | | | | | | |
|---|---|---|---|---|---|---|---|---|---|---|---|---|---|---|---|---|---|---|---|---|---|---|---|---|
| 4372140 | 5d7c | 0000 | 0300 | 5337 | 4b8c | 0000 | 0000 | 88b7 | 4b8c | 0000 | 0000 | 24c7 | 4b8c | 0000 | 0000 | 88a7 | 56f8 | 6160 | 5d7c | 0000 | 0300 | 5337 | 4b8c | 0000 |
| 4372220 | 0000 | 88bf | 4b8c | 0000 | 0000 | 24c7 | 4b8c | 0000 | 0000 | 88a7 | 56f8 | 6160 | 5d7c | 0000 | 0300 | 5337 | 4b8c | 0000 | 0000 | 88c7 | 4b8c | 0000 | 0000 | 24c7 |
| 4372300 | 4b8c | 0000 | 0000 | 88a7 | 56f8 | 6160 | 5d7c | 0000 | 0300 | 5337 | 4b8c | 0000 | 0000 | 88cf | 4b8c | 0000 | 0000 | 24c7 | 4b8c | 0000 | 0000 | 88d7 | 56f8 | 671c |
| 4372360 | 5370 | 5aec | 0300 | 5337 | 4b8c | 0000 | 0000 | 88df | 4b8c | 0000 | 0000 | 5327 | 4b8c | 0000 | 0000 | 88a7 | 228c | d354 | 0019 | de0c | 0000 | 0038 | b27c | b66c |
| 4372440 | 0000 | 133a | 0000 | 136e | 0019 | de10 | 0200 | 0db5 | 0500 | 1cdd | 0000 | 887f | 0000 | 000b | 0000 | 3287 | 00ce | 15e3 | 0000 | 0463 | 0000 | 315f | 2c78 | 002c |
| 4372520 | 0002 | 438a | 5d10 | 0000 | 0400 | 5237 | 6044 | 6840 | 69b0 | 247c | 0019 | c46c | 0014 | 39f8 | 0019 | c48c | 0010 | 2340 | 0019 | c4ac | 0019 | decc | 0000 | 0038 |
| 4372600 | b27c | b66c | 0000 | 133b | 0000 | 136f | 0019 | ded0 | 0200 | 0db5 | 0500 | 1cdd | 0000 | 88e7 | 0000 | 0013 | 0000 | 3287 | 00ce | 2363 | 0000 | 0463 | 0000 | 315f |
| 4372660 | 2c78 | 002c | 0002 | 438a | 56f8 | 671c | 55f0 | 6840 | 55f0 | 69b0 | 5370 | 247c | 0019 | c980 | 0014 | 39f8 | 0019 | c9a0 | 0010 | 2340 | 0019 | c9c0 | 27f0 | 0014 |
| 4372740 | 0019 | e328 | 4e1c | 0000 | 0000 | 0007 | 54f8 | 228c | 2c78 | 0048 | 0002 | 438a | 2520 | 46ec | 4e1c | 0000 | 0000 | 89ff | 32d4 | 247c | 0012 | 747c | 001c | 3348 |
| 4373020 | 4108 | 0000 | 0012 | bdf0 | 0018 | 3d3c | 3280 | 247c | 0012 | bbcc | 0014 | 39a4 | 0012 | 73ec | 0014 | 37f0 | 3cf4 | 234c | 0012 | bc4c | 0019 | df30 | 0000 | 0038 |
| 4373100 | b27c | b66c | 0000 | 133c | 0000 | 1370 | 0019 | df34 | 0200 | 0db5 | 0500 | 1cdd | 0000 | 88ef | 0000 | 000b | 0000 | 3287 | 00ce | 2463 | 0000 | 0463 | 0000 | 315f |
| 4373160 | 2c78 | 002c | 0002 | 438a | 56f8 | 671c | 55f0 | 6840 | 55f0 | 69b0 | 5370 | 247c | 0019 | c328 | 0014 | 39f8 | 0019 | c534 | 0010 | 2340 | 0019 | c554 | 0019 | dfa0 |
| 4373240 | 0000 | 0038 | b27c | b66c | 0000 | 133d | 0000 | 1371 | 0019 | dfa4 | 0200 | 0db5 | 0500 | 1cdd | 0000 | 88f7 | 0000 | 000b | 0000 | 3287 | 00ce | 2563 | 0000 | 0463 |
| 4373320 | 0000 | 315f | 2c78 | 0038 | 0002 | 438a | 56f8 | 671c | 55f0 | 6854 | 55f0 | 6a00 | 55f0 | 69b0 | 5370 | 247c | 0019 | c630 | 0018 | 3a4c | 0019 | c650 | 0014 | 39f8 |
| 4373400 | 0019 | c670 | 0010 | 2340 | 0019 | c690 | 0019 | e080 | 0000 | 0070 | b27c | b66c | 0000 | 133e | 0000 | 1372 | 0019 | dfdc | 0200 | 0db5 | 0500 | 1cdd | 0000 | 8907 |
| 4373460 | 0000 | 000b | 0000 | 3287 | 00ce | 1943 | 0000 | 0463 | 0000 | 315f | 0019 | e080 | 0000 | 0038 | b27c | b66c | 0000 | 133f | 0000 | 1373 | 0019 | e084 | 0200 | 0db5 |
| 4373540 | 0500 | 1cdd | 0000 | 893f | 0000 | 000b | 0000 | 3287 | 00ce | 37c3 | 0000 | 0463 | 0000 | 315f | 2c78 | 0070 | 0002 | 438a | 5d10 | 0000 | 0300 | 57af | 4b8c | 0000 |
| 4373620 | 0000 | 86bf | 4b8c | 0000 | 0000 | 8947 | 55f0 | 4af8 | 0000 | 894f | 6840 | 3310 | 44c4 | 0000 | 0200 | 0ad7 | 4b8c | 0000 | 0000 | 6317 | 4b8c | 0000 | 0000 | 001b |
| 4373700 | 447c | 0000 | 0100 | 61bf | 6bf4 | 247c | 0012 | ec88 | 0014 | 38c0 | 4268 | 0000 | 0000 | 2f7f | 3d24 | 41d4 | 0000 | 000b | 242c | 0000 | 0019 | c770 | 0019 | e0f4 |
| 4373760 | 0000 | 0038 | b27c | b66c | 0000 | 1340 | 0000 | 1374 | 0019 | e0f8 | 0200 | 0db5 | 0500 | 1cdd | 0000 | 890f | 0000 | 000b | 0000 | 3287 | 00ce | 29a3 | 0000 | 0463 |
| 4374040 | 0000 | 315f | 2c78 | 003c | 0002 | 438a | 45c4 | 3364 | 4300 | 0000 | 0000 | 5eef | 0012 | 11f8 | 001c | 3348 | 4108 | 0000 | 0019 | c7f4 | 0018 | 2ecc | 3310 | 408c |
| 4374120 | 000d | d574 | 0014 | 37f0 | 3cf4 | 234c | 0019 | c814 | 0019 | e164 | 0000 | 0038 | b27c | b66c | 0000 | 1341 | 0000 | 1375 | 0019 | e168 | 0200 | 0db5 | 0500 | 1cdd |
| 4374200 | 0000 | 8967 | 0000 | 0013 | 0000 | 3287 | 00ce | 40a3 | 0000 | 0463 | 0000 | 315f | 2954 | 0038 | 0002 | 438a | 56f8 | 671c | 682c | 5758 | 6750 | 6a00 | 5d7c | 0000 |
| 4374260 | 0200 | 57e7 | 6b74 | 58e0 | 0100 | 581f | 6750 | 247c | 0019 | c888 | 0014 | 2ecc | 2410 | 0000 | 0019 | c814 | 0019 | e200 | 0000 | 0070 | b27c | b66c | 0000 | 1342 |
| 4374340 | 0000 | 1376 | 0019 | e1a0 | 0200 | 0db5 | 0500 | 1cdd | 0000 | 895f | 0000 | 0013 | 0000 | 3287 | 00ce | 3fa3 | 0000 | 0463 | 0000 | 315f | 0019 | e200 | 0000 | 0038 |
| 4374420 | b27c | b66c | 0000 | 1343 | 0000 | 1377 | 0019 | e258 | 0200 | 0db5 | 0500 | 1cdd | 0000 | 8917 | 0000 | 000b | 0000 | 3287 | 00ce | 2aa3 | 0000 | 0463 | 0000 | 315f |
| 4374500 | 2c78 | 002c | 0002 | 438a | 3690 | 2520 | 46ec | 4768 | 4550 | 69b0 | 5370 | 4538 | 6c08 | 5370 | 24d0 | 0000 | 000b | 5ef0 | 0018 | 231c | 0019 | cbdc | 0019 | e2bc |
| 4374560 | 0000 | 008c | b27c | b66c | 0000 | 1358 | 0000 | 138c | 0019 | ee2c | 0200 | 0db5 | 0500 | 1cdd | 0000 | 8a27 | 0000 | 0013 | 0000 | 3287 | 00ce | 8d03 | 0000 | 0463 |
| 4374640 | 0000 | 315f | 0019 | e254 | 0000 | 001c | 0019 | 951c | 001a | 3ded | 001a | 3999 | 0019 | cda8 | 0000 | 0000 | 0019 | e2bc | 0000 | 0038 | b27c | b66c | 0000 | 1344 |
| 4374720 | 0000 | 1378 | 0019 | e2c0 | 0200 | 0db5 | 0500 | 1cdd | 0000 | 896f | 0000 | 000b | 0000 | 3287 | 00ce | 4c03 | 0000 | 0463 | 0000 | 315f | 2c78 | 0030 | 0002 | 438a |
| 4375000 | 45c4 | 3348 | 4300 | 0000 | 0000 | 5eef | 0012 | 11f8 | 0018 | 3310 | 40f4 | 0000 | 0019 | c7f4 | 0014 | 37f0 | 3cf4 | 234c | 0019 | ca18 | 0019 | e370 | 0000 | 0070 |
| 4375060 | b27c | b66c | 0000 | 1345 | 0000 | 1379 | 0019 | e2f8 | 0200 | 0db5 | 0500 | 1cdd | 0000 | 896f | 0000 | 0013 | 0000 | 3287 | 00ce | 50c3 | 0000 | 0463 | 0000 | 315f |
| 4375140 | 0019 | e370 | 0000 | 0038 | b27c | b66c | 0000 | 1346 | 0000 | 137a | 0019 | e374 | 0200 | 0db5 | 0500 | 1cdd | 0000 | 896f | 0000 | 001b | 0000 | 3287 | 00ce | 5283 |
| 4375220 | 0000 | 0463 | 0000 | 315f | 2954 | 0044 | 0002 | 438a | 56f8 | 671c | 682c | 4700 | 57b8 | 6af0 | 001c | 6a00 | 3364 | 247c | 0019 | c888 | 0020 | 2ecc | 3894 | 001c |
| 4375300 | 3804 | 40a0 | 0019 | cab8 | 0018 | aa50 | aaf0 | 0001 | ac4c | 3858 | 2420 | 0000 | 0019 | ca50 | 0019 | e3f8 | 0000 | 0038 | b27c | b66c | 0000 | 1347 | 0000 | 137b |
| 4375360 | 0019 | e3fc | 0200 | 0db5 | 0500 | 1cdd | 0000 | 8987 | 0000 | 001b | 0000 | 3287 | 00ce | 55c3 | 0000 | 0463 | 0000 | 315f | 2954 | 0050 | 0002 | 438a | 56f8 | 671c |
| 4375440 | 682c | 5aec | 0300 | 5337 | 67b8 | 5fa0 | 671c | 46ec | 57b8 | 6750 | 6a50 | 5b58 | 0200 | 57d7 | 6750 | 6b74 | 4538 | 6c34 | 5370 | 4568 | 6d50 | 6b74 | 4538 | 4af8 |
| 4375520 | 0000 | 898f | 6bf4 | 247c | 0015 | 366c | 0018 | 231c | 0019 | cab8 | 0019 | e478 | 0000 | 0038 | b27c | b66c | 0000 | 1348 | 0000 | 137c | 0019 | e47c | 0200 | 0db5 |
| 4375600 | 0500 | 1cdd | 0000 | 8977 | 0000 | 000b | 0000 | 3287 | 00ce | 4d03 | 0000 | 0463 | 0000 | 315f | 2c78 | 0048 | 0002 | 438a | 45c4 | 33d8 | 44e8 | 0000 | 0300 | 5357 |
| 4375660 | 5f8c | 671c | 44a0 | 0000 | 0200 | 0daf | 4b8c | 0000 | 0000 | 3287 | 6c34 | 247c | 0008 | c03c | 0018 | 3310 | 40f4 | 0000 | 000d | d574 | 0014 | 37f0 | 3cf4 | 234c |
| 4375740 | 0019 | cb60 | 0019 | e53c | 0000 | 0038 | b27c | b66c | 0000 | 1349 | 0000 | 137d | 0019 | e540 | 0200 | 0db5 | 0500 | 1cdd | 0000 | 8997 | 0000 | 0013 | 0000 | 3287 |
| 4376020 | 00ce | 5b03 | 0000 | 0463 | 0000 | 315f | 2954 | 008c | 0002 | 438a | 56f8 | 687c | 0020 | 69b0 | 5758 | 6160 | 5d7c | 0000 | 0200 | 57d7 | 6e58 | 0020 | 6aa0 | 56f8 |
| 4376100 | 671c | 6a00 | 5d10 | 0000 | 0100 | 87bf | 5a18 | 0000 | 0100 | 269f | 6784 | 43c0 | 0300 | 5357 | 5fa0 | 6af0 | 001c | 6e58 | 0020 | 43e4 | 0200 | 0daf | 4b8c | 0000 |
| 4376160 | 0000 | 3287 | 6b74 | 3c9c | 0000 | 001c | 0008 | c03c | 0024 | 3894 | 0020 | 382c | 001c | 32b8 | 24d0 | 0000 | 0019 | cbdc | 001c | 2ecc | 3818 | 408c | 0019 | cbfc |
| 4376240 | 0014 | 2330 | 0019 | cb60 | 0019 | e61c | 0000 | 0038 | b27c | b66c | 0000 | 134a | 0000 | 137e | 0019 | e620 | 0200 | 0db5 | 0500 | 1cdd | 0000 | 899f | 0000 | 0013 |
| 4376320 | 0000 | 3287 | 00ce | 5fe3 | 0000 | 0463 | 0000 | 315f | 2c78 | 00a6 | 0002 | 438a | 45d0 | 46d8 | 2e7c | ada8 | 2ba0 | 0020 | 0038 | 3a4c | 0012 | 07d8 | 0020 | aa34 |
| 4376400 | 2e98 | 3804 | 32f0 | 001c | 24d0 | 0000 | 0012 | 0acc | 0020 | 3c9c | 0000 | 001c | 0012 | 73cc | 0020 | 37dc | 3df4 | 001c | 242c | 0000 | 0012 | 42d4 | 2c30 | 002e |
| 4376460 | 3bf4 | 0000 | 0012 | 07f8 | 001c | aa34 | 2e98 | 3804 | 32d4 | 247c | 0012 | 0e80 | 001c | 3aa0 | 0012 | 73cc | 001c | 37dc | 3d18 | 234c | 0012 | 4ae4 | 2c30 | 001c |
| 4376540 | 3bf4 | 0000 | 0012 | 5080 | 0014 | aa34 | 2e98 | 3774 | 4e1c | 0000 | 0000 | 88d7 | 723c | 2c58 | 3774 | 4c70 | 0000 | 88d7 | 723c | 90dc | 0019 | e680 | 0000 | 0038 |
| 4376620 | b27c | b66c | 0000 | 134b | 0000 | 137f | 0019 | e684 | 0200 | 0db5 | 0500 | 1cdd | 0000 | 897f | 0000 | 000b | 0000 | 3287 | 00ce | 4e03 | 0000 | 0463 | 0000 | 315f |
| 4376700 | 2c78 | 002c | 0002 | 438a | 5d10 | 0000 | 0200 | 57d7 | 671c | 4af8 | 0000 | 8947 | 56f8 | 4af8 | 0000 | 2f7f | 55f0 | 4af8 | 0000 | 89a7 | 5370 | 228c | 0019 | e708 |
| 4376760 | 0000 | 0038 | b27c | b66c | 0000 | 134c | 0000 | 1380 | 0019 | e70c | 0200 | 0db5 | 0500 | 1cdd | 0000 | 891f | 0000 | 000b | 0000 | 3287 | 00ce | 3183 | 0000 | 0463 |
| 4377040 | 0000 | 315f | 2c78 | 0050 | 0002 | 438a | 5d10 | 0000 | 0500 | 582f | 671c | 5fa0 | 5370 | 5370 | 6840 | 5aec | 0100 | 2627 | 4b8c | 0000 | 0000 | 89af | 3348 | 42ac |
| 4377120 | 0000 | 5eef | 0012 | 11f8 | 0018 | 3310 | 40f4 | 0000 | 0019 | c7f4 | 0014 | 2ecc | 37f0 | 3cf4 | 242c | 0000 | 0019 | cca8 | 0019 | e7fc | 0000 | 0070 | b27c | b66c |
| 4377200 | 0000 | 134d | 0000 | 1381 | 0019 | e744 | 0200 | 0db5 | 0500 | 1cdd | 0000 | 89b7 | 0000 | 0013 | 0000 | 3287 | 00ce | 6543 | 0000 | 0463 | 0000 | 315f | 0019 | e7fc |

```
4377260  0000 0038 b27c b66c 0000 134e 0000 1382 0019 e800 0200 0db5 0500 1cdd 0000 89b7 0000 001b 0000 3287 00ce 68c3 0000 0463
4377340  0000 315f 2954 0084 0002 438a 56f8 671c 682c 4700 57b8 6750 6a00 5b58 0300 877f 6784 6b74 6750 5bc4 0100 2627 6af0 001c
4377420  5d7c 0000 0100 878f 6af0 0020 3364 247c 0019 c888 0024 2ecc 382c 001c 4568 6d94 5370 4538 4b8c 0000 0000 898f 6bf4 247c
4377500  0015 366c 0024 3094 0020 382c 001c 40a0 0019 cd98 0018 aa50 aaf0 0001 ac4c 3858 2420 0000 0019 cd18 0019 e87c 0000 0038
4377560  b27c b66c 0000 134f 0000 1383 0019 e880 0200 0db5 0500 1cdd 0000 89bf 0000 001b 0000 3287 00ce 6cc3 0000 0463 0000 315f
4377640  2954 0048 0002 438a 56f8 671c 682c 5aec 0300 5337 671c 5f8c 46cc 57b8 6750 6a50 5d7c 0000 0200 879f 6b74 6750 4568 6b74
4377720  5370 4538 6d50 6bf4 24d0 0000 0015 366c 0018 231c 0019 cd98 0019 e910 0000 0038 b27c b66c 0000 1350 0000 1384 0019 e914
4400000  0200 0db5 0500 1cdd 0000 8927 0000 000b 0000 3287 00ce 3283 0000 0463 0000 315f 2c78 005a 0002 438a 5d10 0000 0400 58e7
4400060  6750 5fa0 5370 671c 5d7c 0000 0100 2627 4b8c 0000 0000 8357 56f8 6160 5d7c 0000 0100 87b7 4b8c 0000 0000 88cf 56f8 671c
4400140  5370 5aec 0200 8667 4b8c 0000 0000 2f7f 4b8c 0000 0000 89a7 228c 2020 0019 e9dc 0000 0038 b27c b66c 0000 1351 0000 1385
4400220  0019 e9c0 0200 0db5 0500 1cdd 0000 892f 0000 000b 0000 3287 00ce 3383 0000 0463 0000 315f 2c78 0094 0002 438a 5d10 0000
4400300  0400 58e7 6750 5fa0 5370 671c 5d7c 0000 0100 2627 4b8c 0000 0000 89c7 56f8 671c 6840 5aec 0100 87b7 4b8c 0000 0000 88cf
4400360  320c 42ac 0000 5eef 0012 11f8 0018 33d8 320c 442c 0200 0ad7 4b8c 0000 0000 6317 4b8c 0000 0000 001b 447c 0000 0100 61bf
4400440  6c34 247c 0019 ce94 0018 3430 3d6c 320c 4300 0000 0000 6947 0013 380c 0014 37f0 3cf4 234c 0019 ceb4 0019 ea7c 0000 0038
4400520  b27c b66c 0000 1352 0000 1386 0019 ea80 0200 0db5 0500 1cdd 0000 89d7 0000 0013 0000 3287 00ce 75a3 0000 0463 0000 315f
4400600  2c78 0068 0002 438a 45b8 5758 671c 5370 5d10 0000 0200 583f 4b8c 0000 0000 2f7f 55f0 6044 5410 0000 0200 53c7 4b8c 0000
4400660  0000 894f 55f0 671c 55f0 6a50 5370 5758 6a00 5370 24d0 0000 0019 cf3c 0018 3a4c 0019 cf5c 0014 3858 4254 0000 0000 000b
4400740  2420 0000 0019 cf7c 0019 eb4c 0000 0038 b27c b66c 0000 1353 0000 1387 0019 eb50 0200 0db5 0500 1cdd 0000 89df 0000 000b
4401020  0000 3287 00ce 79e3 0000 0463 0000 315f 2c78 0096 0002 438a 56f8 6160 5d7c 0000 0200 8667 4b8c 0000 0000 89ef 4b8c 0000
4401100  0000 5567 56f8 6160 5d7c 0000 0200 8667 4b8c 0000 0000 89f7 4b8c 0000 0000 1c77 56f8 6160 5d7c 0000 0200 8667 4b8c 0000
4401160  0000 89ff 4b8c 0000 0000 88b7 56f8 6160 5d7c 0000 0200 8667 4b8c 0000 0000 8a07 4b8c 0000 0000 89bf 56f8 671c 5370 5aec
4401240  0200 8667 4b8c 0000 0000 8a0f 4b8c 0000 0000 88c7 228c 60fc 0019 ec14 0000 0070 b27c b66c 0000 1354 0000 1388 0019 eb88
4401320  0200 0db5 0500 1cdd 0000 89e7 0000 000b 0000 3287 00ce 7ae3 0000 0463 0000 315f 0019 ec14 0000 0038 b27c b66c 0000 1355
4401400  0000 1389 0019 ec18 0200 0db5 0500 1cdd 0000 89d7 0000 001b 0000 3287 00ce 7be3 0000 0463 0000 315f 2954 0058 0002 438a
4401460  56f8 6868 69b0 4700 57b8 671c 6a00 5aec 0200 53c7 6750 6af0 001c 4568 6d94 5370 4538 4af8 0000 2f7f 6bf4 247c 0015 366c
4401540  0020 392c 001c 3aa0 0019 d0cc 0018 aa50 aaf0 0001 ac4c 3858 2420 0000 0019 cf7c 0019 ec90 0000 0038 b27c b66c 0000 1356
4401620  0000 138a 0019 ec94 0200 0db5 0500 1cdd 0000 8a17 0000 0013 0000 3287 00ce 8663 0000 0463 0000 315f 2954 0044 0002 438a
4401700  56f8 6854 69b0 5758 6160 5b58 0200 8667 6784 6aa0 56f8 671c 6a00 5aec 0100 87bf 6750 3a4c 0019 d130 001c 3818 3bf4 0000
4401760  0019 d1a0 0014 2330 0019 d0cc 0019 ee28 0000 0138 b27c b66c 0000 1357 0000 138b 0019 e204 0200 0db5 0500 1cdd 0000 8a1f
4402040  0000 001b 0000 3287 00ce 8c03 0000 0463 0000 315f 0019 ed08 0000 0040 0000 0000 0000 0000 0000 0000 0000 0000 001a 3ed0
4402120  001a 3f08 001a 3f7c 001a 4024 001a 39d1 001a 4014 001a 409c 0000 0000 0000 0000 0000 0000 0019 ee28 0000 00c0 0000 0000
4402200  0000 0000 0000 0000 0000 0000 0000 0000 0000 0000 0000 0000 0000 0000 0000 0000 0000 0000 0000 0000 0000 0000 0000 0000
4402260  0000 0000 0019 cce0 0019 cc2c 0019 cb38 0019 c750 0019 c50c 0019 c4ec 001a 3ed0 0019 cc88 0000 0000 0000 0000 001a 4084
4402340  0019 cb70 0019 cc0c 0019 cac8 0019 c960 0019 c7d4 0019 c9f8 0000 0000 0019 c898 0019 c824 0000 0000 0000 0000 0019 c6d8
4402420  0019 c600 0000 0000 0019 a044 0019 c44c 0019 951c 0019 9ef0 0000 0000 0000 0000 0000 0000 2c78 0060 0002 438a 2520 4700
4402500  33a0 3380 001c 247c 0019 d1e0 0020 3364 40b4 001c 0019 c888 001c 3d48 447c 0000 0300 5337 6300 4af8 0000 5327 5fa0 247c
4402560  000c 4158 0018 3804 4538 6d80 5370 4568 6d0c 6b74 4538 4af8 0000 898f 6bf4 234c 0015 366c 0019 ef18 0000 0070 b27c b66c
4402640  0000 1359 0000 138d 0019 ee64 0200 0db5 0500 1cdd 0000 89cf 0000 001b 0000 3287 00ce 74a3 0000 0463 0000 315f 0019 ef18
4402720  0000 0038 b27c b66c 0000 135a 0000 138e 0019 ef1c 0200 0db5 0500 1cdd 0000 8937 0000 000b 0000 3287 00ce 3483 0000 0463
4403000  0000 315f 2c78 0080 0002 438a 5d10 0000 0400 58e7 671c 5fa0 5370 6840 5d10 0000 0100 2627 4b8c 0000 0000 8a37 320c 42ac
4403060  0000 5eef 0012 11f8 0018 33d8 320c 442c 0200 0ad7 4b8c 0000 0000 6317 4b8c 0000 0000 001b 447c 0000 0100 61bf 6c34 247c
4403140  0019 ce94 0018 3430 3d6c 320c 4300 0000 0000 6947 0013 380c 0014 37f0 3cf4 234c 0019 d25c 0019 ef7c 0000 0038 b27c b66c
4403220  0000 135b 0000 138f 0019 ef80 0200 0db5 0500 1cdd 0000 8a3f 0000 0013 0000 3287 00ce 92e3 0000 0463 0000 315f 2c78 002c
4403300  0002 438a 5758 6750 5370 5b58 0200 583f 4b8c 0000 0000 2f7f 6784 41e8 0000 0003 239c 0000 0019 d2b4 0019 f1f8 0000 0038
4403360  b27c b66c 0000 135c 0000 1390 0019 f1fc 0200 0db5 0500 1cdd 0000 8a3f 0000 001b 0000 3287 00ce 95a3 0000 0463 0000 315f
4403440  28c4 0118 001a 3f54 45b8 4cc4 0000 0003 57b8 671c 6a00 5aec 0200 53c7 4b8c 0000 0000 894f 55f0 6750 55f0 671c 5370 5aec
4403520  0200 5baf 62c0 5bc4 0300 5ac7 4b8c 0000 0000 0df7 4b8c 0000 0000 8ac7 4b8c 0000 0000 000b 56f8 62c0 5de8 0000 0200 8667
4403600  4b8c 0000 0000 89a7 4b8c 0000 0000 8acf 56f8 671c 5370 5aec 0100 529f 55f0 62c0 5de8 0000 0200 8667 4b8c 0000 0000 88df
4403660  4b8c 0000 0000 88c7 56f8 671c 5370 5aec 0200 8667 4b8c 0000 0000 89a7 4b8c 0000 0000 894f 44e8 0000 0200 0ad7 4b8c 0000
4403740  0000 2ad7 4b8c 0000 0000 000b 44c4 0000 0200 0ad7 4b8c 0000 0000 6317 4b8c 0000 0000 002b 447c 0000 0100 61bf 6bf4 4408
4404020  0200 61bf 6c34 6b74 4538 6bf4 5370 247c 0019 d328 0014 3858 4254 0000 0000 000b 2420 0000 0019 d2b4 27f0 00d4 0019 f19c
4404100  56f8 671c 682c 4cc4 0000 0023 57b8 6750 6a00 5b58 0200 53c7 4b8c 0000 0000 8ad7 55f0 6750 55f0 6784 5370 5bc4 0200 5baf
4404160  64a8 5c30 0300 5ac7 4b8c 0000 0000 0df7 4b8c 0000 0000 8adf 4b8c 0000 0000 000b 57b8 64a8 5e54 0000 0200 8667 4b8c 0000
4404240  0000 89a7 4b8c 0000 0000 8acf 57b8 6784 5370 5bc4 0100 529f 55f0 64a8 5e54 0000 0200 8667 4b8c 0000 0000 88df 4b8c 0000
4404320  0000 8a0f 57b8 6784 5370 5bc4 0200 8667 4b8c 0000 0000 89a7 4b8c 0000 0000 894f 24d0 0000 0019 d328 0014 3858 4254 0000
```

```
4404400 0000 002b 2420 0000 0019 d2b4 2954 0058 0002 438a 56f8 6868 69b0 4700 57b8 671c 6a00 5aec 0200 53c7 6750 6af0 001c 4568
4404460 6d94 5370 4538 4af8 0000 2f7f 6bf4 247c 0015 366c 0020 382c 001c 3aa0 0019 d328 0018 aa50 aaf0 0001 ac4c 3858 2420 0000
4404540 0019 d2b4 0019 f2dc 0000 0038 b27c b65c 0000 135d 0000 1391 0019 f2e0 0200 0db5 0500 1cdd 0000 8a47 0000 0013 0000 3287
4404620 00ce 9943 0000 0463 0000 315f 2954 00ac 0002 438a 56f8 687c 0024 69b0 5758 6af0 0020 55f0 6a50 6a00 3410 0030 3380 0034
4404700 3af4 0024 0019 d1e0 0038 3380 0028 411c 0000 0034 0019 c888 0034 3380 002c 4568 6e1c 0030 5370 4538 4b8c 0000 0000 898f
4404760 6bf4 247c 0015 366c 0030 3484 3eec 002c 4254 0000 0000 24c7 40b4 0028 0019 d3d4 0028 3380 001c 4538 6e58 0024 5370 247c
4405040 000b 5408 0024 3894 0020 3e70 001c 40a0 0019 d3f4 0018 379c 4e1c 0000 0000 0007 2410 0000 0019 d328 0019 f358 0000 0038
4405120 b27c b66c 0000 135e 0000 1392 0019 f35c 0200 0db5 0500 1cdd 0000 8a57 0000 001b 0000 3287 00ce 9fa3 0000 0463 0000 315f
4405200 2954 0044 0002 438a 56f8 67b8 682c 5758 671c 6a00 57b8 6304 5de8 0000 0200 8667 6c34 6784 5758 6750 6a50 5b58 0100 87bf
4405260 6750 247c 0019 cbdc 0018 2ecc 23fc 0000 0019 d3f4 c019 f40c 0000 0070 b27c b66c 0000 135f 0000 1393 0019 f394 0200 0db5
4405340 0500 1cdd 0000 8a5f 0000 001b 0000 3287 00ce a0a3 0000 0463 0000 315f 0019 f40c 0000 0038 b27c b66c 0000 1360 0000 1394
4405420 0019 f410 0200 0db5 0500 1cdd 0000 8a4f 0000 0023 0000 3287 00ce 9ea3 0000 0463 0000 315f 28c4 0044 001a 4070 56f8 671c
4405500 682c 46ec 4768 5818 6750 6aa0 5d10 0000 0300 5337 671c 6d50 5fa0 3050 4568 6b74 5370 4538 6d94 6bf4 24d0 0000 0015 366c
4405560 001c 2304 0019 d3d4 0019 f47c 0000 0038 b27c b66c 0000 1361 0000 1395 0019 f480 0200 0db5 0500 1cdd 0000 8957 0000 0023
4405640 0000 3287 00ce 3b83 0000 0463 0000 315f 2c78 0038 0002 438a 45c4 46d8 4768 47e4 9314 9a90 9300 9a90 aa34 aa18 a554 0012
4405720 38e8 386c 37dc 3788 242c 0000 0019 d51c 23e4 0000 0019 d51c 0019 f4f4 0000 0038 b130 b66c 0000 1362 0000 1396 0019 d999
4406000 0200 0db5 0500 1cdd 0000 8a67 0000 0023 0000 3287 00ce a8e3 0000 0463 0000 315f 2954 0040 0002 438a 45dc 46d8 4754 5818
4406060 6750 6a50 3050 4568 6dd8 5370 4538 6d50 6bf4 247c 0015 366c 001c aa6c aaf0 0001 ac08 38d4 3858 37dc 242c 0000 0019 d51c
4406140 0019 f810 0000 02d8 0000 0000 0013 5876 0013 5876 0013 584a 0013 5861 0019 f4ac 0005 1c94 0019 f4f4 0005 2bd4 0019 d2a0
4406220 0013 587c 0013 5858 0000 0077 0019 f4fc 0005 1c94 0019 f4fc 0005 2020 0019 d2a0 0013 5874 0008 60fc 0000 0000 0013 585a
4406300 0013 585a 0013 584a 0013 583d 0019 f4fc 0005 1c94 0019 f544 0005 2bd4 0019 d2a0 0013 5860 0013 5834 0000 0077 0019 f54c
4406360 0005 1c94 0019 f54c 0005 2020 0019 d2a0 0013 5858 0008 60fc 0000 0000 0013 5836 0013 5836 0013 5816 0013 5631 0019 f54c
4406440 0005 1c94 0019 f594 0005 2bd4 0019 d2a0 0013 583c 0013 5824 0000 0247 0019 f59c 0005 1c94 0019 f59c 0005 2020 0019 d2a0
4406520 0013 5834 0019 f59c 0005 1c94 0019 f59c 0005 1b9c 0019 d7d4 0013 581c 0013 5820 0019 f5b4 0008 90dc 0000 0000 0013 581e
4406600 0013 5816 0013 5631 0000 0247 0019 f5ec 0005 1c94 0019 f5ec 0005 2020 0019 d2a0 0013 5824 0019 d2a0 0013 5814 0019 f5f4
4406660 0005 1b9c 0019 d7d4 0013 5814 0013 5818 0019 f604 0008 90dc 0000 0000 0013 5816 0013 580e 0013 5649 0000 00cf 0019 f63c
4406740 0005 1c94 0019 f63c 0005 2020 0019 d2a0 0013 581c 0019 d2a0 0013 580c 0019 f644 0005 1b9c 0019 d7d4 0013 580c 0013 5810
4407020 0019 f654 0008 90dc 0000 0000 0013 580e 0013 5806 0013 565d 0000 009f 0019 f68c 0005 1c94 0019 f68c 0005 2020 0019 d2a0
4407100 0013 5814 0019 d2a0 0013 5804 0019 f694 0005 1b9c 0019 d7d4 0013 5804 0013 5808 0019 f6a4 0008 90dc 0013 580c 0019 f6dc
4407160 0000 0000 0013 5804 0013 5699 0013 57fc 0000 1ea7 0019 f6dc 0005 1c94 0019 f6dc 0006 a8c0 0019 d2a0 0013 580c 0019 f6dc
4407240 0005 1b9c 0019 d7d4 0013 57f4 0013 57f8 0019 f6f4 0008 90dc 0013 57fc 0019 f72c 0000 0000 0013 57f4 0013 5699 0012 f621
4407320 0000 1ea7 0019 f72c 0005 1c94 0019 f72c 0006 a8c0 0019 d2a0 0013 57fc 0019 f734 0005 1b9c 0019 d7d4 0013 57ec 0013 57f0
4407400 0019 f744 0008 90dc 0000 0000 0013 57ee 0013 57e6 0013 5699 0000 0247 0019 f77c 0005 1c94 0019 f77c 0005 2020 0019 d2a0
4407460 0013 57f4 0019 d2a0 2cac 0028 0002 438a 2ca0 b66c 0000 001c 0000 0005 0019 7464 0019 7664 0002 438a 0019 f7ec 0019 74f0
4407540 0000 0000 0019 7570 0000 0000 0019 75f0 0000 0000 0019 9fe5 0000 0000 0019 f8d4 0000 0030 0000 002c b288 b66c 0000 1398
4407620 7fff ffff 001a 4188 0200 0db5 0100 15ad 0100 33fd 0000 000b 0000 315f 0043 2f68 6f6d 652f 6f73 6173 312f 612f 7669 6a61
4407700 792f 5648 444c 2f70 6172 7365 722f 7072 6f6c 6f67 2f6e 6577 6e65 772f 7633 2e31 2f68 616c 315f 636f 6e73 7472 6169 6e65
4407760 6400 6c20 0046 2f68 6f6d 652f 6f73 6173 312f 612f 7669 6a61 792f 5648 444c 2f70 6172 7365 722f 7072 6f6c 6f67 2f6e 6577
4410040 6e65 772f 7633 2e31 2f68 616c 315f 636f 6e73 7472 6169 6e65 642e 706c 002e 0a67 001a 410c 0000 3f50 7465 725f 6173 7369
4410120 676e 6d65 6e74 7328 5b4f 7065 7261 746f 7273 7c4c 6973 745d 2c20 4e2c 205b 7768 656e 2853 7461 7465 2c41 7373 676e 5374
4410200 6d74 7329 7c52 6573 745d 2920 3a2d 0a09 636f 6e63 6174 5f61 746f 6d28 5b73 7461 7465 2c4e 5d2c 5374 6174 6529 2c0a 0967
4410260 656e 5f72 6567 6973 7465 725f 7369 676e 616c 5f61 7373 6967 6e6d 656e 7473 284f 7065 7261 746f 7273 2c41 7373 676e 5374
4410340 6d74 7329 2c0a 094e 6578 7420 6973 204e 202b 2031 2c0a 0967 656e 5f72 6567 6973 7465 725f 6173 7369 676e 6d65 6e74 7328
4410420 4c69 7374 2c20 4e65 7874 2c20 5265 7374 292e 0a09 0a67 656e 5f72 6567 6973 7465 725f 7369 676e 616c 5f61 7373 6967 6e6d
4410500 656e 7473 285b 5d2c 205b 5d29 2e0a 6765 6e5f 7265 6769 7374 6572 5f73 6967 6e61 6c5f 6173 7369 676e 6d65 6e74 7328 5b4f
4410560 707c 4f70 735d 2c0a 095b 7369 676e 616c 5f61 7373 6967 6e6d 656e 7428 5265 672c 5369 6729 2c69 6e6c 696e 655f 636f 6d6d
4410640 656e 7428 4e61 6d65 297c 5265 7374 5d29 3a2d 0a09 6f70 6572 6174 6f72 5f6f 7574 7075 745f 7265 6769 7374 6572 284f 702c
4410720 204e 616d 652c 2052 6567 292c 0a09 6f70 6572 6174 6f72 5f6f 7574 7075 745f 7369 676e 616c 284f 702c 2053 6967 292c 0a09
4411000 6765 6e5f 7265 6769 7374 6572 5f73 6967 6e61 6c5f 6173 7369 676e 6d65 6e74 7328 4f70 732c 2052 6573 7429 2e0a 0a6f 7065
4411060 7261 746f 725f 6f75 7470 7574 5f72 6567 6973 7465 7228 4f70 4964 2c20 4e61 6d65 2c20 5265 6769 7374 6572 2920 3a2d 0a09
4411140 6f70 6572 6174 6f72 5f62 6c6f 636b 5f6f 7574 7075 745f 7661 7273 285b 4f70 4964 5d2c 5b56 6172 5d29 2c0a 0972 6567 6973
4411220 7465 7228 5661 722c 204e 616d 652c 2052 6567 6973 7465 7229 2e0a 0a6f 7065 7261 746f 725f 6f75 7470 7574 5f73 6967 6e61
4411300 6c28 4f70 4964 2c20 5369 676e 616c 2920 3a2d 0a09 6675 6d61 7028 4f70 4964 2c20 4675 2c20 4e29 2c0a 0963 6f6d 706f 6e65
4411360 6e74 2846 752c 2050 6f72 7473 292c 0a09 6d65 6d62 6572 6368 6b28 706f 7274 284f 7574 2c6f 7574 2c5f 5479 7065 292c 2050
4411440 6f72 7473 292c 0a09 636f 6e63 6174 5f61 746f 6d28 5b66 752c 204e 2c20 4f75 745d 2c20 5369 676e 616c 292e 0a0a 6578 6973
```

```
4411520 7473 5f63 6f6e 7472 6f6c 5f73 7465 7073 2850 726f 6342 6f64 7949 642c 2044 6573 6967 6e2c 204e 2920 3a2d 0a09 636f 6e74
4411600 726f 6c5f 7374 6570 7328 5072 6f63 426f 6479 4964 2c20 4465 7369 676e 2c20 4e29 2e0a 0a25 2525 2525 2525 2525 2525 2525
4411660 2525 2525 2525 2525 2525 2525 2525 2525 2525 2525 2525 2525 2525 2525 2525 2525 2525 2525 2525 2525 2525 2525 2525 2525
4411740 2525 2525 2525 2525 2525 2525 2525 2525 250a 6765 6e5f 7072 6f63 6573 735f 6375 5f61 6e64 5f62 696e 6469 6e67 7328 7072
4412020 6f63 6573 735f 7374 6174 656d 656e 7428 6c61 6265 6c28 6375 5f61 6e64 5f62 696e 6469 6e67 7329 2c5f 2c5b 5d2c 0a09 0909
4412100 0909 2020 2020 2020 5072 6f63 6573 7353 7461 7465 6d65 6e74 7329 293a 2d0a 0967 6574 6462 5f63 7572 7265 6e74 2864 6573
4412160 6967 6e2c 205f 4465 7369 676e 292c 0a09 6578 6973 7473 5f63 6f6e 7472 6f6c 5f73 7465 7073 2869 6428 702d 3329 2c20 5f2c
4412240 204e 292c 0a09 6f70 6572 6174 6f72 735f 696e 5f73 6368 6564 756c 6528 7363 6865 6475 6c65 2c20 5f2c 204e 2c20 4c69 7374
4412320 4f66 4f70 6572 6174 6f72 7329 2c0a 0967 656e 5f63 755f 616e 645f 6269 6e64 696e 6773 284c 6973 744f 664f 7065 7261 746f
4412400 7273 2c20 5072 6f63 6573 7353 7461 7465 6d65 6e74 7329 2e0a 0a67 656e 5f63 755f 616e 645f 6269 6e64 696e 6773 284c 6973
4412460 744f 664f 7065 7261 746f 7273 2c20 5b63 6173 655f 7374 6174 656d 656e 7428 7374 6174 652c 2057 6865 6e4c 6973 7429 5d29
4412540 203a 2d0a 0967 656e 5f63 755f 616e 645f 6269 6e64 696e 6773 284c 6973 744f 664f 7065 7261 746f 7273 2c20 302c 2057 6865
4412620 6e4c 6973 7429 2e0a 0a67 656e 5f63 755f 616e 645f 6269 6e64 696e 6773 285b 5d2c 205f 2c20 5b5d 292e 0a25 2525 2520 4265
4412700 6769 6e20 4f6e 6c79 2066 6f72 2068 616c 0a67 656e 5f63 755f 616e 645f 6269 6e64 696e 6773 284f 704c 6973 742c 2030 2c0a
4412760 2020 2020 2020 2020 2020 2020 2020 2020 2020 2020 5b77 6865 6e28 7374 6174 6530 2c20 5b4f 7041 7373 2c69 665f 7374 6174
4413040 656d 656e 7428 6578 7072 283d 2c66 7531 6f31 2c31 292c 0a20 2020 2020 2020 2020 2020 2020 2020 2020 2020 2020 5b73 6967
4413120 6e61 6c5f 6173 7369 676e 6d65 6e74 286e 6578 745f 7374 6174 652c 7374 6174 6531 292c 0a20 2020 2020 2020 2020 2020 2020
4413200 2020 2020 2020 2020 2065 6c73 6528 5b73 6967 6e61 6c5f 6173 7369 676e 6d65 6e74 2879 6f2c 7969 292c 0a20 2020 2020 2020
4413260 2020 2020 2020 2020 2020 2020 2020 2020 2020 2020 7369 676e 616c 5f61 7373 6967 6e6d 656e 7428 6e65 7874 5f73 7461 7465
4413340 2c73 7461 7465 3029 5d29 5d29 5d29 7c52 6573 745d 2920 3a2d 0a09 6765 6e5f 6375 5f61 6e64 5f62 696e 6469 6e67 7331 285b
4413420 6964 286f 702d 312c 6964 2870 2d35 2929 5d2c 204f 7041 7373 292c 0a09 6765 6e5f 6375 5f61 6e64 5f62 696e 6469 6e67 7328
4413500 4f70 4c69 7374 2c20 312c 2052 6573 7429 2e0a 6765 6e5f 6375 5f61 6e64 5f62 696e 6469 6e67 7328 5b4f 7065 7261 746f 7273
4413560 7c4f 704c 6973 745d 2c20 342c 0a20 2020 2020 2020 2020 2020 2020 2020 2020 205b 7768 656e 2873 7461 7465 342c 5b4f
4413640 7041 7373 2c69 665f 7374 6174 656d 656e 7428 6578 7072 283d 2c63 6f6e 742c 3129 2c0a 2020 2020 2020 2020 2020 2020 2020
4413720 2020 2020 2020 205b 7369 676e 616c 5f61 7373 6967 6e6d 656e 7428 6e65 7874 5f73 7461 7465 2c73 7461 7465 3129 2c0a 2020
4414000 2020 2020 2020 2020 2020 2020 2020 2020 2020 2020 656c 7365 285b 7369 676e 616c 5f61 7373 6967 6e6d 656e 7428 796f 2c72
4414060 6567 3729 2c0a 2020 2020 2020 2020 2020 2020 2020 2020 2020 2020 2020 2020 2020 2073 6967 6e61 6c5f 6173 7369 676e 6d65
4414140 6e74 286e 6578 745f 7374 6174 652c 7374 6174 6530 295d 295d 295d 297c 5265 7374 5d29 3a2d 0a09 6765 6e5f 6375 5f61 6e64
4414220 5f62 696e 6469 6e67 7331 284f 7065 7261 746f 7273 2c20 4f70 4173 7329 2c0a 0967 656e 5f63 755f 616e 645f 6269 6e64 696e
4414300 6773 284f 704c 6973 742c 2035 2c20 5265 7374 292e 0a25 2525 2520 456e 6420 6f6e 6c79 2066 6f72 2068 616c 0a67 656e 5f63
4414360 755f 616e 645f 6269 6e64 696e 6773 285b 4f70 6572 6174 6f72 737c 4f70 4c69 7374 5d2c 204e 2c20 5b77 6865 6e28 5374 6174
4414440 652c 2041 7373 6967 6e6d 656e 7473 297c 5265 7374 5d29 203a 2d0a 0963 6f6e 6361 745f 6174 6f6d 285b 7374 6174 652c 4e5d
4414520 2c20 5374 6174 6529 2c0a 0967 656e 5f63 755f 616e 645f 6269 6e64 696e 6773 3128 4f70 6572 6174 6f72 732c 2041 7373 6967
4414600 6e6d 656e 7473 292c 0a09 4e65 7874 2069 7320 4e20 2b20 312c 0a09 6765 6e5f 6375 5f61 6e64 5f62 696e 6469 6e67 7328 4f70
4414660 4c69 7374 2c20 4e65 7874 2c20 5265 7374 292e 0a09 0a67 656e 5f63 755f 616e 645f 6269 6e64 696e 6773 3128 5b5d 2c20 5b5d
4414740 292e 0a67 656e 5f63 755f 616e 645f 6269 6e64 696e 6773 3128 5b4f 707c 4f70 735d 2c20 5b41 7373 496e 2c41 7373 4f75 747c
4415020 5265 7374 5d29 203a 2d0a 0965 756d 6170 284f 702c 2046 752c 204e 292c 0a09 636f 6d70 6f6e 656e 7428 4675 2c20 506f 7274
4415100 7329 2c0a 0963 6f6e 6361 745f 6174 6f6d 285b 6675 2c4e 5d2c 4675 5072 6566 6978 292c 0a09 636f 6d70 6f6e 656e 745f 706f
4415160 7274 5f73 6967 6e61 6c73 2850 6f72 7473 2c20 696e 2c20 4675 5072 6566 6978 2c20 506f 7274 7349 6e29 2c0a 096f 7065 7261
4415240 746f 725f 626c 6f63 6b5f 696e 7075 745f 7661 7273 285b 4f70 5d2c 2056 6172 7349 6e29 2c0a 096f 7065 7261 746f 725f 696e
4415320 7075 745f 6173 7369 676e 6d65 6e74 7328 506f 7274 7349 6e2c 2056 6172 7349 6e2c 2041 7373 496e 292c 0a25 0963 6f6d 706f
4415400 6e65 6e74 5f70 6f72 745f 7369 676e 616c 7328 506f 7274 732c 206f 7574 2c20 4675 5072 6566 6978 2c20 506f 7274 734f 7574
4415460 292c 0a25 096f 7065 7261 746f 725f 626c 6f63 6b5f 6f75 7470 7574 5f76 6172 7328 5b4f 705d 2c20 5661 7273 4f75 7429 2c0a
4415540 2509 6f70 6572 6174 6f72 5f6f 7574 7075 745f 6173 7369 676e 6d65 6e74 7328 5661 7273 4f75 742c 2050 6f72 7473 4f75 742c
4415620 2041 7373 4f75 7429 2c0a 0941 7373 4f75 7420 3d20 5b5d 2c0a 0967 656e 5f63 755f 616e 645f 6269 6e64 696e 6773 3128 4f70
4415700 732c 2052 6573 7429 2e0a 0a6f 7065 7261 746f 725f 696e 7075 745f 6173 7369 676e 6d65 6e74 7328 5b5d 2c20 5f2c 205b 5d29
4415760 2e0a 6f70 6572 6174 6f72 5f69 6e70 7574 5f61 7373 6967 6e6d 656e 7473 285b 5369 676e 616c 7c53 6967 6e61 6c73 5d2c 205b
4416040 5661 727c 5661 7273 5d2c 0a09 5b73 6967 6e61 6c5f 6173 7369 676e 6d65 6e74 2853 6967 6e61 6c2c 5265 6769 7374 6572 292c
4416120 696e 6c69 6e65 5f63 6f6d 6d65 6e74 284e 616d 6529 7c52 6573 745d 2920 3a2d 0a09 7265 6769 7374 6572 2856 6172 2c20 4e61
4416200 6d65 2c20 5265 6769 7374 6572 292c 212c 0a09 6f70 6572 6174 6f72 5f69 6e70 7574 5f61 7373 6967 6e6d 656e 7473 2853 6967
4416260 6e61 6c73 2c20 5661 7273 2c52 6573 7429 2e0a 0a6f 7065 7261 746f 725f 6f75 7470 7574 5f61 7373 6967 6e6d 656e 7473 285f
4416340 2c20 5f2c 205b 5d29 2e0a 2f2a 0a6f 7065 7261 746f 725f 6f75 7470 7574 5f61 7373 6967 6e6d 656e 7473 285b 5d2c 205f 2c20
4416420 5b5d 292e 0a6f 7065 7261 746f 725f 6f75 7470 7574 5f61 7373 6967 6e6d 656e 7473 285b 5661 727c 5661 7273 5d2c 205b 5369
4416500 676e 616c 7c53 6967 6e61 6c73 5d2c 0a09 5b73 6967 6e61 6c5f 6173 7369 676e 6d65 6e74 2852 6567 6973 7465 722c 5369 676e
4416560 616c 292c 696e 6c69 6e65 5f63 6f6d 6d65 6e74 2[illegible]4e 616d 6529 7c52 6573 745d 2920 3a2d 0a09 7265 6769 7374 6572 2856 6172
```

```
4416640  2c20 4e61 6d65 2c20 5265 6769 7374 6572 292c 212c 0a09 6f70 6572 6174 6f72 5f6f 7574 7075 745f 6173 7369 676e 6d65 6e74
4416720  7328 5661 7273 2c20 5369 676e 616c 732c 2052 6573 7429 2e0a 2a2f 0a63 6f6d 706f 6e65 6e74 5f70 6f72 745f 7369 676e 616c
4417000  7328 5b5d 2c5f 2c5f 2c5b 5d29 203a 2d20 212e 0a63 6f6d 706f 6e65 6e74 5f70 6f72 745f 7369 676e 616c 7328 5b50 6f72 747c
4417060  5461 696c 5d2c 2054 7970 652c 2050 7265 6669 782c 205b 5369 676e 616c 7c52 6573 745d 2920 3a2d 0a09 506f 7274 203d 2070
4417140  6f72 7428 4e61 6d65 2c54 7970 652c 5f29 2c20 212c 0a09 636f 6e63 6174 5f61 746f 6d28 5b50 7265 6669 782c 4e61 6d65 5d2c
4417220  2053 6967 6e61 6c29 2c0a 0963 6f6d 706f 6e65 6e74 5f70 6f72 745f 7369 676e 616c 7328 5461 696c 2c20 5479 7065 2c20 5072
4417300  6566 6978 2c20 5265 7374 292e 0a63 6f6d 706f 6e65 6e74 5f70 6f72 745f 7369 676e 616c 7328 5b5f 506f 7274 7c54 6169 6c5d
4417360  2c20 5479 7065 2c20 5072 6566 6978 2c20 5265 7374 2920 3a2d 0a09 636f 6d70 6f6e 656e 745f 706f 7274 5f73 6967 6e61 6c73
4417440  2854 6169 6c2c 2054 7970 652c 2050 7265 6669 782c 2052 6573 7429 2e0a 0a25 2525 2525 2525 2525 2525 2525 2525 2525 2525
4417520  2525 2525 2525 2525 2525 2525 2525 2525 2525 2525 2525 2525 2525 2525 2525 2525 2525 2525 2525 2525 2525 2525 2525 2525
4417600  2525 2525 2525 2525 2525 2525 250a 2525 2525 2047 656e 6572 616c 2055 7469 6c69 7469 6573 2028 7368 6f75 6c64 2062 6520 7075
4417660  7420 696e 2061 2064 6966 6665 7265 6e74 2066 696c 6529 0a25 2525 2525 2525 2525 2525 2525 2525 2525 2525 2525 2525 2525
4417740  2525 2525 2525 2525 2525 2525 2525 2525 2525 2525 2525 2525 2525 2525 2525 2525 2525 2525 2525 2525 2525 2525 2525 2525
4420020  2525 2525 250a 0a3a 2d20 656e 7375 7265 5f6c 6f61 6465 6428 6c69 6272 6172 7928 7374 7269 6e67 7329 292e 0a0a 0a25 2525
4420100  2520 4c69 7374 2069 7320 6f62 7461 696e 6564 2062 7920 6170 7065 6e64 696e 6720 7468 6520 6e75 6d62 6572 7320 5b4c 6f77
4420160  6572 2c55 7070 6572 5d2c 2074 6f20 7468 6520 4174 6f6d 2e0a 0a73 7472 696e 676c 6973 7428 4c6f 7765 722c 2055 7070 6572
4420240  2c20 4174 6f6d 2c20 4c69 7374 2920 3a2d 0a09 696e 7465 6765 7228 4c6f 7765 7229 2c0a 0969 6e74 6567 6572 2855 7070 6572
4420320  292c 0a09 280a 0920 2020 204c 6f77 6572 203d 3c20 5570 7065 7220 2d3e 2073 7472 696e 676c 6973 7431 284c 6f77 6572 2c20
4420400  5570 7065 722c 2041 746f 6d2c 204c 6973 7429 0a09 3b0a 0920 2020 2073 7472 696e 676c 6973 7431 2855 7070 6572 2c20 4c6f
4420460  7765 722c 2041 746f 6d2c 204c 6973 7429 0a09 292e 0a0a 7374 7269 6e67 6c69 7374 3128 4c6f 7765 722c 204c 6f77 6572 2c20
4420540  4174 6f6d 2c20 5b4c 6973 745d 2920 3a2d 2021 2c0a 0963 6f6e 6361 745f 6174 6f6d 285b 4174 6f6d 2c4c 6f77 6572 5d2c 4c69
4420620  7374 292e 0a73 7472 696e 676c 6973 7431 284c 6f77 6572 2c20 5570 7065 722c 2041 746f 6d2c 205b 456c 656d 656e 747c 4c69
4420700  7374 5d29 203a 2420 212c 0a09 636f 6e63 6174 5f61 746f 6d28 5b41 746f 6d2c 4c6f 7765 725d 2c20 456c 656d 656e 7429 2c0a
4420760  094e 6578 7420 6973 204c 6f77 6572 2b31 2c0a 0973 7472 696e 676c 6973 7431 284e 6578 742c 2055 7070 6572 2c20 4174 6f6d
4421040  2c20 4c69 7374 292e 0a0a 2525 2525 2525 2525 2525 2525 2525 2525 2525 2525 2525 2525 2525 2525 2525 2525 2525 2525 2525
4421120  2525 2525 2525 2525 2525 2525 2525 2525 2525 2525 2525 2525 2525 2525 2525 2525 2525 2525 2525 0a25 2525 2525 2525 2525
4421200  2525 2525 2525 2525 2525 0a0a 6765 6e5f 7265 6769 7374 6572 5f73 6967 6e61 6c73 2852 6567 6973 7465 7253 6967 6e61 6c73
4421260  2920 3a2d 0a09 6669 6e64 616c 6c28 5369 676e 616c 2c20 7265 6769 7374 6572 285f 2c5f 2c53 6967 6e61 6c29 2c20 5369 676e
4421340  616c 7329 2c0a 096c 6973 745f 746f 5f73 6574 2853 6967 6e61 6c73 2c20 5369 676e 616c 5365 7429 2c0a 0967 656e 5f72 6567
4421420  6973 7465 725f 7369 676e 616c 5f64 6563 6c61 7261 7469 6f6e 2853 6967 6e61 6c53 6574 2c52 6567 6973 7465 7253 6967 6e61
4421500  6c73 292e 0a20 0a67 656e 5f72 6567 6973 7465 725f 7369 676e 616c 5f64 6563 6c61 7261 7469 6f6e 285b 5d2c 205b 5d29 2e0a
4421560  6765 6e5f 7265 6769 7374 6572 5f73 6967 6e61 6c5f 6465 636c 6172 6174 696f 6e28 5b53 6967 6e61 6c7c 5369 676e 616c 735d
4421640  2c0a 095b 7369 676e 616c 5f64 6563 6c61 7261 7469 6f6e 2853 6967 6e61 6c2c 2054 7970 6529 2c69 6e6c 696e 655f 636f 6d6d
4421720  656e 7428 6c69 7374 284e 616d 6573 2929 7c52 6573 745d 293a 2d0a 0966 696e 6461 6c6c 284e 616d 652c 2072 6567 6973 7465
4422000  7228 5f2c 4e61 6d65 2c53 6967 6e61 6c29 2c20 4e61 6d65 7329 2c0a 0972 6567 6973 7465 7228 5661 7249 642c 204e 616d 652c
4422060  2053 6967 6e61 6c29 2c21 2c0a 0967 6574 5f74 7970 6528 5661 7249 642c 2054 7970 6529 2c0a 0967 656e 5f72 6567 6973 7465
4422140  725f 7369 676e 616c 5f64 6563 6c61 7261 7469 6f6e 2853 6967 6e61 6c73 2c20 5265 7374 292e 0a09 0a67 6574 5f74 7970 6528
4422220  4964 2c20 5479 7065 2920 3a2d 0a09 6973 5f76 6172 6961 626c 6528 4964 2920 2d3e 2076 6172 6961 626c 655f 6964 2856 6172
4422300  2c20 4964 292c 6578 6973 7473 2856 6172 292c 0a09 2020 2020 2020 2020 2020 2020 2020 2020 2020 2076 6172 6961 626c 655f
4422360  7479 7065 2856 6172 2c20 5479 7065 290a 097c 2069 735f 636f 6e73 7461 6e74 2849 6429 202d 3e20 636f 6e73 7461 6e74 5f69
4422440  6428 436f 6e73 742c 2049 6429 2c65 7869 7374 7328 436f 6e73 7429 2c0a 0920 2020 2020 2020 2020 2020 2020 2020 2020 2020
4422520  2020 636f 6e73 7461 6e74 5f74 7970 6528 436f 6e73 742c 2054 7970 6529 0a20 2020 2020 2020 207c 2069 735f 636f 6e74 726f
4422600  6c28 4964 2920 2d3e 2054 7970 6520 3d20 6269 740a 2020 2020 2020 2020 7c20 6f74 6865 7277 6973 6520 2d3e 2054 7970 6520
4422660  3d20 6269 742e 0a0a 2525 2525 2525 2525 2525 2525 2525 2525 2525 2525 2525 2525 2525 2525 2525 2525 2525 2525 2525 2525
4422740  2525 2525 2525 2525 2525 2525 2525 2525 2525 2525 2525 2525 2525 2525 2525 2525 2525 2525 2525 0a67 656e 5f73 7461 7465
4423020  5f73 6967 6e61 6c73 2873 6967 6e61 6c5f 6465 636c 6172 6174 696f 6e28 5b73 7461 7465 2c6e 6578 745f 7374 6174 655d 2c20
4423100  7374 6174 655f 7479 7065 2929 2e0a 2525 2525 2525 2525 2525 2525 2525 2525 2525 2525 2525 2525 2525 2525 2525 2525 2525
4423160  2525 2525 2525 2525 2525 2525 2525 2525 2525 2525 2525 2525 2525 2525 2525 2525 2525 2525 2525 2525 2525 2525 0a0a 6765
4423240  6e5f 7374 7275 6374 7572 616c 5f63 6f6d 706f 6e65 6e74 7328 626c 6f63 6b5f 7374 6174 656d 656e 7428 6c61 6265 6c28 7374
4423320  7275 6374 7572 6529 2c20 5f2c 205b 5d2c 205b 5d2c 0a09 2020 2020 2020 2020 2020 2020 2020 2020 2020 5374 7275 6374 7572
4423400  616c 436f 6d70 6f6e 656e 7473 2929 203a 2d0a 0967 6574 6462 5f63 7572 7265 6e74 2864 6573 6967 6e2c 4465 7369 676e 292c
4423460  0a09 6465 7369 676e 5f66 756e 6374 696f 6e5f 756e 6974 7328 4465 7369 676e 2c20 4675 6e63 7469 6f6e 556e 6974 7329 2c21
4423540  2c0a 0967 656e 5f66 755f 696e 7374 616e 6365 7328 4675 6e63 7469 6f6e 556e 6974 732c 2053 7472 7563 7475 7261 6c43 6f6d
4423620  706f 6e65 6e74 7329 2e0a 090a 6765 6e5f 6675 5f69 6e73 7461 6e63 6573 2846 756e 6374 696f 6e55 6e69 7473 2c20 5374 7275
4423700  6374 7572 616c 436f 6d70 6f6e 656e 7473 2920 3a2d 0a09 6765 6e5f 6675 5f69 6e73 7461 6e63 6573 2846 756e 6374 696f 6e55
```

```
4423760 6e69 7473 2c20 312c 2053 7472 7563 7475 7261 6c43 6f6d 706f 6e65 6e74 7329 2e0a 0a67 656e 5f66 755f 696e 7374 616e 6365
4424040 7328 5b5d 2c20 5f2c 205b 5d29 2e0a 6765 6e5f 6675 5f69 6e73 7461 6e63 6573 285b 4655 7c46 5573 5d2c 204e 2c0a 095b 636f
4424120 6d70 6f6e 656e 745f 696e 7374 616e 7469 6174 696f 6e28 6c61 6265 6c28 4c61 6265 6c29 2c46 552c 706f 7274 5f6d 6170 2850
4424200 6f72 744d 6170 2929 7c52 6573 745d 293a 2d0a 0963 6f6d 706f 6e65 6e74 2846 552c 2050 6f72 7473 292c 2021 2c0a 0963 6f6e
4424260 6361 745f 6174 6f6d 285b 6675 2c4e 5d2c 4c61 6265 6c29 2c0a 0967 656e 5f69 6e74 6572 6661 6365 5f73 6967 6e61 6c5f 746f
4424340 5f70 6f72 745f 6d61 7073 2850 6f72 7473 2c20 4c61 6265 6c2c 2050 6f72 744d 6170 292c 0a09 4e65 7874 2069 7320 4e20 2b20
4424420 312c 0a09 6765 6e5f 6675 5f69 6e73 7461 6e63 6573 2846 5573 2c20 4e65 7874 2c20 5265 7374 292e 0a0a 6765 6e5f 696e 7465
4424500 7266 6163 655f 7369 676e 616c 5f74 6f5f 706f 7274 5f6d 6170 7328 5b5d 2c20 5f2c 205b 5d29 2e0a 6765 6e5f 696e 7465 7266
4424560 6163 655f 7369 676e 616c 5f74 6f5f 706f 7274 5f6d 6170 7328 5b70 6f72 7428 4e61 6d65 2c5f 2c5f 297c 506f 7274 735d 2c20
4424640 5072 6566 6978 2c0a 0920 2020 2020 2020 2020 2020 2020 2020 2020 2020 2020 2020 2020 205b 6173 736f 6369 6174 696f 6e28
4424720 4e61 6d65 2c53 6967 6e61 6c4e 616d 6529 7c50 6f72 744d 6170 5d29 203a 2d0a 0963 6f6e 6361 745f 6174 6f6d 285b 5072 6566
4425000 6978 2c20 4e61 6d65 5d2c 2053 6967 6e61 6c4e 616d 6529 2c0a 0967 656e 5f69 6e74 6572 6661 6365 5f73 6967 6e61 6c5f 746f
4425060 5f70 6f72 745f 6d61 7073 2850 6f72 7473 2c20 5072 6566 6978 2c20 506f 7274 4d61 7029 2e0a 0a25 2525 2525 2525 2525 2525
4425140 2525 2525 2525 2525 2525 2525 2525 2525 2525 2525 2525 2525 2525 2525 2525 2525 2525 2525 2525 2525 2525 2525 2525 2525
4425220 2525 2525 2525 2525 2525 2525 2525 2525 2525 250a 0a25 2525 2520 5072 6f63 6573 7320 6f66 2074 6865 2066 6f72 6d3a 0a25
4425300 2525 250a 2525 2525 2073 6574 5f73 7461 7465 3a0a 2525 2525 2020 2020 7072 6f63 6573 730a 2525 2525 2020 2020 6265 6769
4425360 6e0a 2525 2525 2020 2009 2020 2020 7761 6974 2075 6e74 696c 206e 6f74 2063 6c6b 2773 7461 626c 6520 616e 6420 636c 6b20
4425440 3d20 2731 273b 0a25 2525 2509 2020 2020 7374 6174 6520 3c3d 206e 6578 745f 7374 6174 653b 0a25 2525 2520 2020 2065 6e64
4425520 2070 726f 6365 7373 2073 6574 5f73 7461 7465 3b0a 0a67 656e 5f70 726f 6365 7373 5f73 6574 5f73 7461 7465 2870 726f 6365
4425600 7373 5f73 7461 7465 6d65 6e74 286c 6162 656c 2873 6574 5f73 7461 7465 292c 5f2c 5b5d 2c0a 0909 0920 2020 205b 7379 6e6f
4425660 7073 7973 5f77 6169 745f 7374 6174 656d 656e 7428 636c 6b29 2c0a 0909 0920 2020 7369 676e 616c 5f61 7373 6967 6e6d
4425740 656e 7428 7374 6174 652c 206e 6578 745f 7374 6174 6529 5d29 292e 0a0a 2525 2525 2525 2525 2525 2525 2525 2525 2525 2525
4426020 2525 2525 2525 2525 2525 2525 2525 2525 2525 2525 2525 2525 2525 2525 2525 2525 2525 2525 2525 2525 2525 2525 2525 2525
4426100 2525 2525 2525 2525 2525 0a0a 6765 6e5f 7072 6f63 6573 735f 6173 7369 676e 5f72 6567 6973 7465 7273 2870 726f 6365 7373
4426160 5f73 7461 7465 6d65 6e74 286c 6162 656c 2861 7373 6967 6e5f 7265 6769 7374 6572 7329 2c5f 2c5b 5d2c 0a09 5b73 796e 6f70
4426240 7379 735f 7761 6974 5f73 7461 7465 6d65 6e74 2863 6c6b 297c 5265 6769 7374 6572 4173 7369 676e 6d65 6e74 735d 2929 203a
4426320 2d0a 0967 6574 6462 5f63 7572 7265 6e74 2864 6573 6967 6e2c 205f 4465 7369 676e 292c 0a09 6578 6973 7473 5f63 6f6e 7472
4426400 6f6c 5f73 7465 7073 2869 6428 702d 3329 2c20 5f2c 204e 292c 0a09 6f70 6572 6174 6f72 735f 696e 5f73 6368 6564 756c 6528
4426460 7363 6865 6475 6c65 2c20 5f2c 204e 2c20 4c69 7374 4f66 4f70 6572 6174 6f72 7329 2c0a 0967 656e 5f72 6567 6973 7465 725f
4426540 6173 7369 676e 6d65 6e74 7328 4c69 7374 4f66 4f70 6572 6174 6f72 732c 2052 6567 6973 7465 7241 7373 6967 6e6d 656e 7473
4426620 292e 0a0a 2525 2525 2067 656e 6572 6174 6520 6120 6c61 7267 6520 6361 7365 2073 7461 7465 6d65 6e74 2066 6f72 2072 6567
4426700 6973 7465 7220 7369 676e 616c 2061 7373 6967 6e6d 656e 7473 0a0a 6765 6e5f 7265 6769 7374 6572 5f61 7373 6967 6e6d 656e
4426760 7473 284c 6973 744f 664f 7065 7261 746f 7273 2c0a 0909 5b63 6173 655f 7374 6174 656d 656e 7428 7374 6174 652c 5b77 6865
4427040 6e28 7374 6174 6530 2c5b 496e 7075 7473 2c4f 7574 7075 7473 5d29 2c57 6865 6e4c 6973 745d 295d 293a 2d0a 0967 656e 5f69
4427120 6e70 7574 5f66 726f 6d5f 706f 7274 7328 496e 7075 7473 292c 0a09 6765 6e5f 6f75 7470 7574 5f74 6f5f 706f 7274 7328 4f75
4427200 7470 7574 7329 2c0a 0967 656e 5f72 6567 6973 7465 725f 6173 7369 676e 6d65 6e74 7328 4c69 7374 4f66 4f70 6572 6174 6f72
4427260 732c 2031 2c20 5768 656e 4c69 7374 292e 0a0a 0a67 656e 5f69 6e70 7574 5f66 726f 6d5f 706f 7274 7328 5b73 6967 6e61 6c5f
4427340 6173 7369 676e 6d65 6e74 2872 6567 312c 7829 2c0a 0909 2020 2020 2020 7369 676e 616c 5f61 7373 6967 6e6d 656e 7428 7265
4427420 6732 2c61 292c 0a09 0920 2020 2020 2073 6967 6e61 6c5f 6173 7369 676e 6d65 6e74 2872 6567 332c 7529 2c0a 0909 2020 2020
4427500 2020 7369 676e 616c 5f61 7373 6967 6e6d 656e 7428 7265 6734 2c64 7829 2c0a 0909 2020 2020 2020 7369 676e 616c 5f61 7373
4427560 6967 6e6d 656e 7428 7265 6737 2c79 6929 5d29 2e0a 0909 090a 001a 189c 0000 0080 0019 9ce0 0019 9e84 0019 9da4 0019 c4ec
4427640 001a 3ed0 001a 3f08 001a 3f7c 001a 4024 001a 39d1 001a 4014 001a 409c 0000 0000 0000 0000 0000 0000 0000 0000 0000 0000
4427720 0000 0000 0000 0000 0000 0000 0000 0000 0000 0000 0000 0000 0000 0000 0019 a044 0019 c44c 0019 951c 0019 9ef0 0000 0000
4430000 0000 0000 0000 0000 001a 38ac 0000 1f88 656c 206f 7574 7075 7429 0a25 2525 2525 2525 2525 2525 2525 2525 2525 2525 2525
4430060 2525 2525 2525 2525 2525 2525 2525 2525 2525 2525 2525 2525 2525 2525 2525 2525 2525 2525 2525 2525 2525 2525 2525 2525
4430140 2525 2525 2525 0a3a 2d20 656e 7375 7265 5f6c 6f61 6465 6428 6c69 6272 6172 7928 6461 7465 2929 2e0a 3a2d 2065 6e73 7572
4430220 655f 6c6f 6164 6564 286c 6962 7261 7279 286c 6973 7473 2929 2e0a 3a2d 2065 6e73 7572 655f 6c6f 6164 6564 286c 6962 7261
4430300 7279 2861 6464 706f 7274 7261 7929 292e 0a25 2525 2525 2525 2525 2525 2525 2525 2525 2525 2525 2525 2525 2525 2525 2525
4430360 2525 2525 2525 2525 2525 2525 2525 2525 2525 2525 2525 2525 2525 2525 2525 2525 2525 2525 2525 2525 2525 2525 0a25 2525
4430440 2520 7573 6520 6f6e 6c79 2077 6865 6e20 7072 696e 7469 6e67 206f 7574 2076 6864 6c0a 2525 3a2d 2061 6464 5f70 6f72 7472
4430520 6179 2877 7269 7465 5f76 6864 6c29 2e0a 2525 2525 2525 2525 2525 2525 2525 2525 2525 2525 2525 2525 2525 2525 2525 2525
4430600 2525 2525 2525 2525 2525 2525 2525 2525 2525 2525 2525 2525 2525 2525 2525 2525 2525 2525 2525 2525 2525 2525 250a 2525
4430660 2525 2043 5f5e 6375 7272 656e 7420 5374 6174 656d 656e 7473 2048 616e 646c 6572 0a0a 2525 2525 2042 6c6f 636b 2053 7461
4430740 7465 6d65 6e74 0a0a 7772 6974 655f 7668 646c 2862 6c6f 636b 5f73 7461 7465 6d65 6e74 286c 6162 656c 284c 6162 656c 292c
4431020 2047 7561 7264 4578 7072 6573 7369 6f6e 2c0■ 0920 2020 2020 2020 2020 2020 2020 2020 2020 2020 4865 6164 6572 2c20 4465
```

| | | | | | | | | | | | | | | | | | | | | | | | | |
|---|---|---|---|---|---|---|---|---|---|---|---|---|---|---|---|---|---|---|---|---|---|---|---|---|
| 4431100 | 636c | 6172 | 6174 | 696f | 6e73 | 2c20 | 5374 | 6174 | 6564 | 656e | 7473 | 2929 | 203a | 2d0a | 0928 | 6e6f | 6e76 | 6172 | 284c | 6162 | 656c | 2920 | 2d3e | 2066 |
| 4431160 | 5f72 | 6d61 | 7428 | 277e | 6e7e | 6e7e | 703a | 272c | 205b | 4c61 | 6265 | 6c5d | 2920 | 3b20 | 7472 | 7565 | 292c | 0a09 | 7668 | 646c | 5f70 | 6f73 | 2854 | 6162 |
| 4431240 | 292c | 0a09 | 666f | 726d | 6174 | 2827 | 7e6e | 7e70 | 626c | 6f63 | 6b27 | 2c20 | 5b76 | 6864 | 6c5f | 7461 | 6228 | 5461 | 6229 | 5d29 | 2c0a | 0928 | 6e6f | 6e76 |
| 4431320 | 6172 | 2847 | 7561 | 7264 | 4578 | 7072 | 6573 | 7369 | 6f6e | 2920 | 2d3e | 2066 | 6f72 | 6d61 | 7428 | 2720 | 287e | 7029 | 272c | 205b | 4775 | 6172 | 6445 | 7870 |
| 4431400 | 7265 | 7373 | 696f | 6e5d | 293b | 7472 | 7565 | 292c | 0a09 | 7772 | 6974 | 655f | 7668 | 646c | 2076 | 6864 | 6c5f | 6e6f | 705f | 7461 | 6228 | 5f29 | 292c | 0a09 |
| 4431460 | 7772 | 6974 | 655f | 7668 | 646c | 2848 | 6561 | 6465 | 7229 | 2c0a | 0977 | 7269 | 7465 | 5f76 | 6864 | 6c28 | 4465 | 636c | 6172 | 6174 | 696f | 6e73 | 292c | 0a09 |
| 4431540 | 666f | 726d | 6174 | 2827 | 7e6e | 7e70 | 6265 | 6769 | 6e27 | 2c20 | 5b76 | 6864 | 6c5f | 7461 | 6228 | 5461 | 6229 | 5d29 | 2c0a | 0977 | 7269 | 7465 | 5f76 | 6864 |
| 4431620 | 6c28 | 7668 | 646c | 5f6e | 6f70 | 5f74 | 6162 | 285f | 2929 | 2c0a | 0977 | 7269 | 7465 | 5f76 | 6864 | 6c28 | 5374 | 6174 | 656d | 656e | 7473 | 292c | 0a09 | 666f |
| 4431700 | 726d | 6174 | 2827 | 7e6e | 7e70 | 656e | 6420 | 626c | 6f63 | 6b27 | 2c20 | 5b76 | 6864 | 6c5f | 7461 | 6228 | 5461 | 6229 | 5d29 | 2c0a | 0928 | 6e6f | 6e76 | 6172 |
| 4431760 | 284c | 6162 | 656c | 2920 | 2d3e | 2066 | 6f72 | 6d61 | 7428 | 2720 | 7e70 | 272c | 205b | 4c61 | 6265 | 6c5d | 2920 | 3b20 | 7472 | 7565 | 292c | 0a09 | 7072 | 696e |
| 4432040 | 7428 | 273b | 2729 | 2e0a | 0a25 | 2525 | 2520 | 5072 | 6f63 | 6573 | 7320 | 5374 | 6174 | 656d | 656e | 740a | 0a77 | 7269 | 7465 | 5f76 | 6864 | 6c28 | 7072 | 6f63 |
| 4432120 | 6573 | 735f | 7374 | 6174 | 656d | 656e | 7428 | 6c61 | 6265 | 6c28 | 4c61 | 6265 | 6c29 | 2c0a | 0909 | 0920 | 2020 | 2020 | 5365 | 6e73 | 6974 | 6976 | 6974 | 794c |
| 4432200 | 6973 | 742c | 0a09 | 0909 | 2020 | 2020 | 2050 | 726f | 6365 | 7373 | 4465 | 636c | 6172 | 6174 | 696f | 6e73 | 2c0a | 0920 | 2020 | 2020 | 2020 | 2020 | 2020 | 2020 |
| 4432260 | 2020 | 2020 | 2020 | 2020 | 5072 | 6f63 | 6573 | 7353 | 7461 | 7465 | 6d65 | 6e74 | 7329 | 2920 | 3a2d | 0a09 | 286e | 6f6e | 7661 | 7228 | 4c61 | 6265 | 6c29 | 202d |
| 4432340 | 3e20 | 666f | 726d | 6174 | 2827 | 7e6e | 7e6e | 7e70 | 3a27 | 2c20 | 5b4c | 6162 | 656c | 5d29 | 203b | 2074 | 7275 | 6529 | 2c0a | 0976 | 6864 | 6c5f | 706f | 7328 |
| 4432420 | 5461 | 6229 | 2c0a | 0966 | 6f72 | 6d61 | 7428 | 277e | 6e7e | 7070 | 726f | 6365 | 7373 | 272c | 205b | 7668 | 646c | 5f74 | 6162 | 2854 | 6162 | 295d | 292c | 0a09 |
| 4432500 | 286e | 6f6e | 7661 | 7228 | 5365 | 6e73 | 6974 | 6976 | 6974 | 794c | 6973 | 7429 | 202d | 3e20 | 666f | 726d | 6174 | 2827 | 2028 | 7e70 | 2927 | 2c20 | 5b53 | 656e |
| 4432560 | 7369 | 7469 | 7669 | 7479 | 4c69 | 7374 | 5d29 | 3b74 | 7275 | 6529 | 2c0a | 0977 | 7269 | 7465 | 5f76 | 6864 | 6c28 | 7668 | 646c | 5f6e | 6f70 | 5f74 | 6162 | 285f |
| 4432640 | 2929 | 2c0a | 0977 | 7269 | 7465 | 5f76 | 6864 | 6c28 | 5072 | 6f63 | 6573 | 7344 | 6563 | 6c61 | 7261 | 7469 | 6f6e | 7329 | 2c0a | 0966 | 6f72 | 6d61 | 7428 | 277e |
| 4432720 | 6e7e | 7062 | 6567 | 696e | 272c | 205b | 7668 | 646c | 5f74 | 6162 | 2854 | 6162 | 295d | 292c | 0a09 | 7772 | 6974 | 655f | 7668 | 646c | 2876 | 6864 | 6c5f | 6e6f |
| 4433000 | 705f | 7461 | 6228 | 5f29 | 292c | 0a09 | 7772 | 6974 | 655f | 7668 | 646c | 2850 | 726f | 6365 | 7373 | 5374 | 6174 | 656d | 656e | 7473 | 292c | 0a09 | 666f | 726d |
| 4433060 | 6174 | 2827 | 7e6e | 7e70 | 656e | 6420 | 7072 | 6f63 | 6573 | 7327 | 2c20 | 5b76 | 6864 | 6c5f | 7461 | 6228 | 5461 | 6229 | 5d29 | 2c0a | 0928 | 6e6f | 6e76 | 6172 |
| 4433140 | 284c | 6162 | 656c | 2920 | 2d3e | 2066 | 6f72 | 6d61 | 7428 | 2720 | 7e70 | 272c | 205b | 4c61 | 6265 | 6c5d | 2920 | 3b20 | 7472 | 7565 | 292c | 0a09 | 7072 | 696e |
| 4433220 | 7428 | 273b | 2729 | 2e0a | 0a25 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 4433300 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 0a25 | 2525 | 2520 | 5365 | 7175 |
| 4433360 | 656e | 7469 | 616c | 2053 | 7461 | 7465 | 6d65 | 6e74 | 7320 | 4861 | 6e64 | 6c65 | 720a | 0a25 | 2525 | 2520 | 5369 | 676e | 616c | 2061 | 7373 | 6967 | 6e6d | 656e |
| 4433440 | 7420 | 7374 | 6174 | 656d | 656e | 7420 | 0a0a | 7772 | 6974 | 655f | 7668 | 646c | 2073 | 6967 | 6e61 | 6c5f | 6173 | 7369 | 676e | 6d65 | 6e74 | 2854 | 6172 | 6765 |
| 4433520 | 742c | 2045 | 7870 | 7265 | 7373 | 696f | 6e29 | 2920 | 3a2d | 0a09 | 7668 | 646c | 5f70 | 6f73 | 2854 | 6162 | 292c | 0a09 | 666f | 726d | 6174 | 2827 | 7e6e | 7e70 |
| 4433600 | 7e70 | 203c | 3d20 | 7e70 | 3b27 | 2c20 | 5b76 | 6864 | 6c5f | 7461 | 6228 | 5461 | 6229 | 2c20 | 5461 | 7267 | 6574 | 2c20 | 4578 | 7072 | 6573 | 7369 | 6f6e | 5d29 |
| 4433660 | 2e0a | 0a25 | 2525 | 2520 | 4361 | 7365 | 2053 | 7461 | 7465 | 6d65 | 6e74 | 0a0a | 7772 | 6974 | 655f | 7668 | 646c | 2863 | 6173 | 655f | 7374 | 6174 | 656d | 656e |
| 4433740 | 7428 | 4578 | 7072 | 6573 | 7369 | 6f6e | 2c20 | 416c | 7465 | 726e | 6174 | 6976 | 6573 | 4c69 | 7374 | 2929 | 203a | 2d0a | 0976 | 6864 | 6c5f | 706f | 7328 | 5461 |
| 4434020 | 6229 | 2c0a | 0966 | 6f72 | 6d61 | 7428 | 277e | 6e7e | 7063 | 6173 | 6520 | 7e70 | 2069 | 737e | 707e | 707e | 707e | 6e7e | 7065 | 6e64 | 2063 | 6173 | 653b | 272c |
| 4434100 | 0a09 | 095b | 7668 | 646c | 5f74 | 6162 | 2854 | 6162 | 292c | 2045 | 7870 | 7265 | 7373 | 696f | 6e2c | 2076 | 6864 | 6c5f | 6e6f | 705f | 7461 | 6228 | 5f29 | 2c20 |
| 4434160 | 7668 | 646c | 5f6e | 6f70 | 5f74 | 6162 | 285f | 292c | 0a09 | 0920 | 416c | 7465 | 726e | 6174 | 6976 | 6573 | 4c69 | 7374 | 2c20 | 7668 | 646c | 5f74 | 6162 | 2854 |
| 4434240 | 6162 | 295d | 292e | 0a0a | 7772 | 6974 | 655f | 7668 | 646c | 2877 | 6865 | 6e28 | 4368 | 6f69 | 6365 | 2c20 | 5374 | 6174 | 656d | 656e | 7473 | 2929 | 203a | 2d0a |
| 4434320 | 0966 | 6f72 | 6d61 | 7428 | 277e | 6e7e | 7077 | 6865 | 6e20 | 7e70 | 203d | 3e7e | 707e | 7027 | 2c0a | 0909 | 5b76 | 6864 | 6c5f | 756e | 7461 | 6228 | 5f29 | 2c20 |
| 4434400 | 4368 | 6f69 | 6365 | 2c20 | 7668 | 646c | 5f6e | 6f70 | 5f74 | 6162 | 285f | 292c | 2053 | 7461 | 7465 | 6d65 | 6e74 | 735d | 292e | 0a0a | 2525 | 2525 | 2049 | 6620 |
| 4434460 | 5374 | 6174 | 656d | 656e | 7420 | 0a0a | 7772 | 6974 | 655f | 7668 | 646c | 2869 | 665f | 7374 | 6174 | 656d | 656e | 7428 | 436f | 6e64 | 6974 | 696f | 6e2c | 2053 |
| 4434540 | 7461 | 7465 | 6d65 | 6e74 | 7329 | 2920 | 3a2d | 0a09 | 7668 | 646c | 5f70 | 6f73 | 2854 | 6162 | 292c | 0a09 | 666f | 726d | 6174 | 2827 | 7e6e | 7e70 | 6966 | 207e |
| 4434620 | 7020 | 7468 | 656e | 7e70 | 7e70 | 7e6e | 7e70 | 656e | 6420 | 6966 | 3b27 | 2c0a | 0909 | 5b76 | 6864 | 6c5f | 7461 | 6228 | 5461 | 6229 | 2c20 | 436f | 6e64 | 6974 |
| 4434700 | 696f | 6e2c | 2076 | 6864 | 6c5f | 6e6f | 705f | 7461 | 6228 | 5f29 | 2c0a | 0909 | 2053 | 7461 | 7465 | 6d65 | 6e74 | 732c | 2076 | 6864 | 6c5f | 7461 | 6228 | 5461 |
| 4434760 | 6229 | 5d29 | 2e0a | 0a77 | 7269 | 7465 | 5f76 | 6864 | 6c28 | 656c | 7369 | 6628 | 436f | 6e64 | 6974 | 696f | 6e2c | 2053 | 7461 | 7465 | 6d65 | 6e74 | 7329 | 2920 |
| 4435040 | 3a2d | 0a09 | 666f | 726d | 6174 | 2827 | 7e6e | 7e70 | 656c | 7369 | 6620 | 7e70 | 2074 | 6865 | 6e7e | 707e | 7027 | 2c20 | 0a09 | 095b | 7668 | 646c | 5f75 | 6e74 |
| 4435120 | 6162 | 285f | 292c | 2043 | 6f6e | 6469 | 7469 | 6f6e | 2c20 | 7668 | 646c | 5f6e | 6f70 | 5f74 | 6162 | 285f | 292c | 2053 | 7461 | 7465 | 6d65 | 6e74 | 735d | 292e |
| 4435200 | 0a0a | 7772 | 6974 | 655f | 7668 | 646c | 2865 | 6c73 | 6528 | 5374 | 6174 | 656d | 656e | 7473 | 2929 | 203a | 2d0a | 0966 | 6f72 | 6d61 | 7428 | 277e | 6e7e | 7065 |
| 4435260 | 6c73 | 657e | 707e | 7027 | 2c0a | 0909 | 5b76 | 6864 | 6c5f | 756e | 7461 | 6228 | 5f29 | 2c20 | 7668 | 646c | 5f6e | 6f70 | 5f74 | 6162 | 285f | 292c | 2053 | 7461 |
| 4435340 | 7465 | 6d65 | 6e74 | 735d | 292e | 0a0a | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 |
| 4435420 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 2525 | 250a | 2525 | 2525 | 2044 |
| 4435500 | 6563 | 6c61 | 7261 | 7469 | 7665 | 2069 | 7465 | 6d73 | 2068 | 616e | 646c | 6572 | 0a0a | 2525 | 2525 | 2053 | 6967 | 6e61 | 6c20 | 6465 | 636c | 6172 | 6174 | 696f |
| 4435560 | 6e0a | 0a77 | 7269 | 7465 | 5f76 | 6864 | 6c28 | 7369 | 676e | 616c | 5f64 | 6563 | 6c61 | 7261 | 7469 | 6f6e | 2853 | 6967 | 6e61 | 6c2c | 2053 | 7562 | 7479 | 7065 |
| 4435640 | 496e | 6469 | 6361 | 7469 | 6f6e | 2929 | 203a | 2d0a | 0976 | 6864 | 6c5f | 706f | 7328 | 5461 | 6229 | 2c0a | 0966 | 6f72 | 6d61 | 7428 | 277e | 6e7e | 7073 | 6967 |
| 4435720 | 6e61 | 6c20 | 272c | 205b | 7668 | 646c | 5f74 | 6162 | 2854 | 6162 | 295d | 292c | 0a09 | 2869 | 735f | 6c69 | 7374 | 2853 | 6967 | 6e61 | 6c29 | 202d | 3e20 | 7772 |
| 4436000 | 6974 | 655f | 7668 | 646c | 5f6c | 6973 | 7428 | 5369 | 676e | 616c | 2920 | 3b20 | 7772 | 6974 | 6528 | 5369 | 676e | 616c | 2929 | 2c0a | 0966 | 6f72 | 6d61 | 7428 |
| 4436060 | 2720 | 3a20 | 7e70 | 3b27 | 2c20 | 5b53 | 7562 | 7479 | 7065 | 496e | 6469 | 6361 | 7469 | 6f6e | 5d29 | 2e0a | 0a25 | 2525 | 2520 | 456e | 756d | 6572 | 6174 | 6564 |
| 4436140 | 2074 | 7970 | 6520 | 6465 | 636c | 6172 | 6174 | 696f | 6e2e | 0a0a | 7772 | 6974 | 655f | 7669 | 646c | 2874 | 7970 | 655f | 6465 | 636c | 6172 | 6174 | 696f | 6e28 |

```
4436220 656e 756d 6572 6174 696f 6e5f 7479 7065 2c20 4e61 6d65 2c20 4465 6669 6e69 7469 6f6e 2929 203a 2d20 212c 0a09 7668 646c
4436300 5f70 6f73 2854 6162 292c 0a09 666f 726d 6174 2827 7e6e 7e70 7479 7065 207e 7020 6973 2028 272c 205b 7668 646c 5f74 6162
4436360 2854 6162 292c 204e 616d 655d 292c 0a09 7772 6974 655f 7668 646c 5f6c 6973 7428 4465 6669 6e69 7469 6f6e 292c 0a09 666f
4436440 726d 6174 2827 293b 272c 205b 5d29 2e0a 0a25 2525 2520 4f72 6469 6e61 7279 2074 7970 6520 6465 636c 6172 6174 696f 6e0a
4436520 0a77 7269 7465 5f76 6864 6c28 7479 7065 5f64 6563 6c61 7261 7469 6f6e 285f 2c20 4e61 6d65 2c20 5479 7065 4465 6669 6e69
4436600 7469 6f6e 2929 203a 2d0a 0976 6864 6c5f 706f 7328 5461 6229 2c0a 0966 6f72 6d61 7428 277e 6e7e 7074 7970 6520 7e70 2069
4436660 7320 7e70 3b27 2c20 5b76 6864 6c5f 7461 6228 5461 6229 2c20 4e61 6d65 2c20 5479 7065 4465 6669 6e69 7469 6f6e 5d29 2e0a
4436740 0a25 2525 2520 4f72 6469 6e61 7279 2073 7562 7479 7065 2064 6563 6c61 7261 7469 6f6e 0a0a 7772 6974 655f 7668 646c 2873
4437020 7562 7479 7065 5f64 6563 6c61 7261 7469 6f6e 285f 2c20 4e61 6d65 2c20 5479 7065 4465 6669 6e69 7469 6f6e 2929 203a 2d0a
4437100 0976 6864 6c5f 706f 7328 5461 6229 2c0a 0966 6f72 6d61 7428 277e 6e7e 7073 7562 7479 7065 207e 7020 6973 207e 703b 272c
4437160 205b 7668 646c 5f74 6162 2854 6162 292c 204e 616d 652c 2054 7970 6544 6566 696e 6974 696f 6e5d 292e 0a0a 2525 2525 2525
4437240 2525 2525 2525 2525 2525 2525 2525 2525 2525 2525 2525 2525 2525 2525 2525 2525 2525 2525 2525 2525 2525 2525 2525 2525
4437320 2525 2525 2525 2525 2525 2525 2525 2525 2525 2525 2525 2525 250a 2525 2525 2045 7870 7265 7373 696f 6e20 6861 6e64 6c65 720a
4437400 0a25 2525 2520 4269 6e61 7279 206f 7065 7261 746f 7273 0a0a 7772 6974 655f 7668 646c 2865 7870 7228 4f70 2c20 4578 7072
4437460 312c 2045 7870 7232 2929 203a 2d0a 0966 6f72 6d61 7428 2728 7e70 207e 7020 7e70 2927 2c20 5b45 7870 7231 2c20 4f70 2c20
4437540 4578 7072 325d 292e 0a0a 2525 2525 2055 6e61 7279 206f 7065 7261 746f 7273 0a0a 7772 6974 655f 7668 646c 2865 7870 7228
4437620 4f70 2c20 4578 7072 2929 203a 2d0a 0966 6f72 6d61 7428 2728 7e70 207e 7029 272c 205b 4f70 2c20 4578 7072 5d29 2e0a 0a25
4437700 2525 2525 2525 2525 2525 2525 2525 2525 2525 2525 2525 2525 2525 2525 2525 2525 2525 2525 2525 2525 2525 2525 2525 2525
4437760 2525 2525 2525 2525 2525 2525 2525 2525 2525 2525 2525 2525 2525 2525 0a25 2525 2520 4d69 7363 656c 6c61 6e65 6f75 730a
4440040 0a25 2525 2520 4965 6164 6572 2066 6f72 2061 2056 4844 4c20 6669 6c65 206f 6620 7468 6520 666f 726d 0a2f 2a0a 2d2d 0a2d
4440120 2d20 2054 6974 6c65 3a20 0954 4553 545f 5254 4c0a 2d2d 2020 4372 6561 7465 643a 0957 6564 2046 6562 2032 3120 3136 3a34
4440200 303a 3031 2031 3939 300a 2d2d 2020 4175 7468 6f72 3a20 0956 696a 6179 204e 6167 6173 616d 790a 2d2d 0909 3c76 696a 6179
4440260 406f 7361 636c 3139 3e0a 2d2d 0a2d 2d20 204e 6f74 653a 2009 4120 7361 6d70 6c65 2052 542d 4c45 5645 4c20 6465 7369 676e
4440340 2e0a 2d2d 0a2a 2f0a 0a77 7269 7465 5f76 6864 6c28 6865 6164 6572 2854 6974 6c65 2c20 4e6f 7465 2929 203a 2d0a 0976 6864
4440420 6c5f 706f 7328 3029 2c0a 0974 696d 655f 7374 616d 7028 2725 3357 2025 334d 2025 6420 2530 3263 3a25 3032 693a 2530 3273
4440500 2025 7927 2c20 5469 6d65 292c 0a09 666f 726d 6174 2827 2d2d 7e6e 272c 205b 5d29 2c0a 0966 6f72 6d61 7428 272d 2d20 2054
4440560 6974 6c65 3a7e 3230 7c7e 707e 6e27 2c20 5b54 6974 6c65 5d29 2c0a 0966 6f72 6d61 7428 272d 2d20 2043 7265 6174 6564 3a7e
4440640 3230 7c7e 707e 6e27 2c20 5b54 696d 655d 292c 0a09 666f 726d 6174 2827 2d2d 2020 4175 7468 6f72 3a7e 3230 7c7e 707e 6e27
4440720 2c20 5b27 5061 7274 6974 696f 6e65 7220 7665 7273 696f 6e20 312e 3027 5d29 2c0a 0966 6f72 6d61 7428 272d 2d7e 6e27 2c20
4441000 5b5d 292c 0a09 666f 726d 6174 2827 2d2d 2020 4e6f 7465 3a7e 3230 7c7e 707e 6e27 2c20 5b4e 6f74 655d 292e 0a0a 2525 2525
4441060 2050 6163 6b61 6765 0a0a 7772 6974 655f 7668 646c 2870 6163 6b61 6765 5f64 6563 6c61 7261 7469 6f6e 284e 616d 652c 2044
4441140 6563 6c61 7261 7469 6f6e 7329 2920 3a2d 0a09 7668 646c 5f70 6f73 2854 6162 292c 0a09 666f 726d 6174 2827 7e6e 7e70 7061
4441220 636b 6167 6520 7e70 2069 737e 707e 707e 6e7e 7065 6e64 207e 703b 272c 0a09 2020 2020 2020 2020 5b76 6864 6c5f 7461 6228
4441300 5461 6229 2c20 4e61 6d65 2c20 7668 646c 5f6e 6f70 5f74 6162 285f 292c 0a09 0920 4465 636c 6172 6174 696f 6e73 2c20 7668
4441360 646c 5f74 6162 2854 6162 292c 204e 616d 655d 292e 0a09 0a77 7269 7465 5f76 6864 6c28 7061 636b 6167 655f 626f 6479 284e
4441440 616d 652c 2044 6563 6c61 7261 7469 6f6e 7329 2920 3a2d 0a09 7668 646c 5f70 6f73 2854 6162 292c 0a09 666f 726d 6174 2827
4441520 7e6e 7e6e 7e70 7061 636b 6167 6520 626f 6479 207e 7020 6973 7e70 7e70 7e6e 7e70 656e 6420 7e70 3b27 2c0a 0920 2020 2020
4441600 2020 205b 7668 646c 5f74 6162 2854 6162 292c 204e 616d 652c 2076 6864 6c5f 6e6f 705f 7461 6228 5f29 2c0a 0909 2044 6563
4441660 6c61 7261 7469 6f6e 732c 2076 6864 6c5f 7461 6228 5461 6229 2c20 4e61 6d65 5d29 2e0a 0a25 2525 2520 456e 7469 7479 0a0a
4441740 7772 6974 655f 7668 646c 2865 6e74 6974 795f 6465 636c 6172 6174 696f 6e28 4e61 6d65 2c20 506f 7274 436c 6175 7365 2929
4442020 203a 2d0a 0976 6864 6c5f 706f 7328 3029 2c0a 0966 6f72 6d61 7428 277e 6e7e 6e65 6e74 6974 7920 7e70 2069 737e 707e 707e
4442100 6e65 6e64 207e 703b 7e6e 272c 0a09 095b 4e61 6d65 2c20 7668 646c 5f6e 6f70 5f74 6162 285f 292c 2050 6f72 7443 6c61 7573
4442160 652c 204e 616d 655d 292e 0a0a 2525 2525 2041 7263 6869 7465 6374 7572 650a 0a77 7269 7465 5f76 6864 6c28 6172 6368 6974
4442240 6563 7475 7265 2841 7263 684e 616d 652c 2045 6e74 6974 794e 616d 652c 2041 7263 6844 6563 6c73 2c20 4172 6368 5374 6d74
4442320 7329 2920 3a2d 0a09 7668 646c 5f70 6f73 2830 292c 0a09 7668 646c 5f74 6162 2854 6162 292c 0a09 666f 726d 6174 2827 7e6e
4442400 6172 6368 6974 6563 7475 7265 207e 7020 6f66 207e 7020 6973 7e6e 7e70 7e70 7e6e 7e6e 6265 6769 6e7e 6e7e 707e 707e 6e7e
4442460 6e65 6e64 207e 703b 7e6e 272c 200a 0909 5b41 7263 684e 616d 652c 2045 6e74 6974 794e 616d 652c 0a09 0920 7668 646c 5f6e
4442540 6f70 5f74 6162 2854 6162 292c 2041 7263 6844 6563 6c73 2c0a 0909 2076 6864 6c5f 6e6f 705f 7461 6228 5461 6229 2c20 4172
4442620 6368 5374 6d74 732c 2041 7263 684e 616d 655d 292e 0a0a 2525 2525 2043 6f6d 706f 6e65 6e74 2064 6563 6c61 7261 7469 6f6e
4442700 2073 7461 7465 6d65 6e74 2e20 0a25 2525 2520 466f 726d 6174 3a0a 2525 2525 2020 2020 636f 6d70 6f6e 656e 7420 4144 440a
4442760 2525 2525 2020 2009 2020 2020 706f 7274 2028 2069 6e31 203a 2069 6e20 2069 6e74 3b0a 2525 2525 0920 2020 2020 2020 2020
4443040 2020 696e 3220 3a20 696e 2020 696e 743b 0a25 2525 2509 2020 2020 2020 2020 2020 2073 756d 203a 206f 7574 2069 6e74 2029
4443120 3b0a 2525 2525 2020 2020 656e 6420 636f 6d70 6f6e 656e 743b 0a0a 7772 6974 655f 7668 646c 2863 6f6d 706f 6e65 6e74 5f64
4443200 6563 6c61 7261 7469 6f6e 2843 6f6d 706f 6e65 6e74 4e61 6d65 2c20 506f 7274 436c 6175 7365 2929 203a 2d0a 0976 6864 6c5f
4443260 706f 7328 5461 6229 2c0a 0966 6f72 6d61 7428 277e 6e7e 7063 6f6d 706f 6e65 6e74 207e 707e 707e 707e 6e7e 7065 6e64 2063
```

```
4443340 5f6d 706f 6e65 6e74 3b27 2c0a 0909 5b76 6864 6c5f 7461 6228 5461 6229 2c20 436f 6d70 6f6e 656e 744e 616d 652c 2076 6864
4443420 6c5f 6e6f 705f 7461 6228 5f29 2c0a 0909 2050 6f72 7443 6c61 7573 652c 2076 6864 6c5f 7461 6228 5461 6229 5d29 2e0a 0a25
4443500 2525 2520 506f 7274 2063 6c61 7573 650a 2525 2525 2046 6f72 6d61 743a 0a25 2525 2520 2020 2070 6f72 7420 2820 5820 3a20
4443560 696e 2069 6e74 3b0a 2525 2525 2020 2020 2020 2020 2020 2043 4c4b 203a 2069 6e20 6269 743b 0a25 2525 2520 2020 2020 2020
4443640 2020 2020 596f 203a 206f 7574 2069 6e74 2029 3b0a 0a77 7269 7465 5f76 6864 6c28 706f 7274 5f63 6c61 7573 6528 506f 7274
4443720 7329 2920 3a2d 0a09 7668 646c 5f70 6f73 2854 6162 292c 0a09 666f 726d 6174 2827 7e6e 7e70 706f 7274 2028 207e 7027 2c20
4444000 5b76 6864 6c5f 7461 6228 5461 6229 2c20 7668 646c 5f74 6162 6966 7928 5f29 5d29 2c0a 0977 7269 7465 5f70 6f72 745f 6c69
4444060 7374 2850 6f72 7473 292c 0a09 666f 726d 6174 2827 2029 3b27 2c20 5b5d 292e 0a0a 2525 2525 2043 6f6d 706f 6e65 6e74 2069
4444140 6e73 7461 6e74 6961 7469 6f6e 2073 7461 7465 6d65 6e74 2e0a 0a77 7269 7465 5f76 6864 6c28 636f 6d70 6f6e 656e 745f 696e
4444220 7374 616e 7469 6174 696f 6e28 6c61 6265 6c28 4c61 6265 6c29 2c20 4e61 6d65 2c20 506f 7274 4d61 7029 2920 3a2d 0a09 7668
4444300 646c 5f70 6f73 2854 6162 292c 0a09 666f 726d 6174 2827 7e6e 7e70 7e70 3a20 7e70 207e 703b 272c 205b 7668 646c 5f74 6162
4444360 2854 6162 292c 204c 6162 656c 2c20 4e61 6d65 2c20 506f 7274 4d61 705d 292e 0a0a 7772 6974 655f 7668 646c 2870 6f72 745f
4444440 6d61 7028 5369 676e 616c 7329 2920 3a2d 0a09 7072 696e 7428 2770 6f72 7420 6d61 7020 2827 292c 0a09 7772 6974 655f 7668
4444520 646c 5f6c 6973 7428 5369 676e 616c 7329 2c0a 0970 7269 6e74 2827 2927 292e 0a0a 2525 2525 2041 7373 6f63 6961 7469 6f6e
4444600 2065 6c65 6d65 6e74 0a0a 7772 6974 655f 7668 646c 2861 7373 6f63 6961 7469 6f6e 2846 6f72 6d61 6c2c 2041 6374 7561 6c29
4444660 2920 3a2d 0a09 666f 726d 6174 2827 7e70 203d 3e20 7e70 272c 205b 466f 726d 616c 2c20 4163 7475 616c 5d29 2e0a 0a25 2525
4444740 2520 506f 7274 2069 6e74 6572 6661 6365 2073 6967 6e61 6c20 6465 636c 6172 6174 696f 6e20 0a0a 7772 6974 655f 7668 646c
4445020 2870 6f72 7428 5369 676e 616c 732c 2044 6972 6563 7469 6f6e 2c20 5479 7065 2929 203a 2d0a 0928 6973 5f6c 6973 7428 5369
4445100 676e 616c 7329 202d 3e20 7772 6974 655f 7668 646c 5f6c 6973 7428 5369 676e 616c 7329 3b70 7269 6e74 2853 6967 6e61 6c73
4445160 2929 2c0a 0966 6f72 6d61 7428 2720 3a20 7e70 207e 7027 2c20 5b44 6972 6563 7469 6f6e 2c20 5479 7065 5d29 2e0a 0a25 2525
4445240 2520 5379 6e6f 7073 7973 2077 6169 7420 7374 6174 656d 656e 740a 2525 2525 2046 6f72 6d61 743a 0a25 2525 2520 2009 7761
4445320 6974 2075 6e74 696c 206e 6f74 2063 6c6b 2773 7461 626c 6520 616e 6420 636c 6b20 3d20 2731 273b 0a0a 7772 6974 655f 7668
4445400 646c 2873 796e 6f70 7379 735f 7761 6974 5f73 7461 7465 6d65 6e74 2853 6967 6e61 6c29 2920 3a2d 0a09 7668 646c 5f70 6f73
4445460 2854 6162 292c 0a09 666f 726d 6174 2822 7e6e 7e70 7761 6974 2075 6e74 696c 206e 6f74 207e 7027 7374 6162 6c65 2061 6e64
4445540 207e 7020 3d20 2731 273b 222c 0a09 095b 7668 646c 5f74 6162 2854 6162 292c 2053 6967 6e61 6c2c 2053 6967 6e61 6c5d 292e
4445620 0a0a 2525 2525 2049 6e6c 696e 6520 436f 6d6d 656e 740a 0a77 7269 7465 5f76 6864 6c28 696e 6c69 6e65 5f63 6f6d 6d65 6e74
4445700 2843 6f6d 6d65 6e74 2929 203a 2d0a 096e 6f6e 7661 7228 436f 6d6d 656e 7429 202d 3e0a 0909 6375 7272 656e 745f 706f 7369
4445760 7469 6f6e 2843 7572 506f 7329 2c0a 0909 7668 646c 5f63 6f6d 6d65 6e74 5f63 6f6c 756d 6e28 436f 6d43 6f6c 292c 0a09 0928
4446040 4375 7250 6f73 203e 2043 6f6d 436f 6c20 2d3e 2043 6f6c 2069 7320 4375 7250 6f73 202b 2031 3b20 436f 6c20 6973 2043 6f6d
4446120 436f 6c29 2c0a 0909 666f 726d 6174 2827 7e2a 7c2d 2d20 7e70 272c 205b 436f 6c2c 2043 6f6d 6d65 6e74 5d29 0a09 3b20 7472
4446200 7565 2e0a 0a25 2525 2520 5573 6520 636c 6175 7365 0a0a 7772 6974 655f 7668 646c 2875 7365 5f63 6c61 7573 6528 5061 636b
4446260 6167 6529 2920 3a2d 0a09 666f 726d 6174 2827 7e6e 7e6e 5573 6520 776f 726b 2e7e 702e 616c 6c3b 272c 205b 5061 636b 6167
4446340 655d 292e 0a0a 2525 2525 2056 4844 4c20 5461 6220 616e 6420 556e 7461 6220 616e 6420 5461 6269 6679 0a0a 7772 6974 655f
4446420 7668 646c 2876 6864 6c5f 7461 6228 5461 6229 2920 3a2d 0a09 7668 646c 5f74 6162 2854 6162 292c 0a09 666f 726d 6174 2827
4446500 7e2a 2b27 2c5b 5461 625d 292e 0a0a 7772 6974 655f 7668 646c 2876 6864 6c5f 6e6f 705f 7461 6228 5461 6229 2920 3a2d 0a09
4446560 7668 646c 5f74 6162 2854 6162 292e 0a0a 7772 6974 655f 7668 646c 2876 6864 6c5f 756e 7461 6228 5461 6229 2920 3a2d 0a09
4446640 7668 646c 5f75 6e74 6162 2854 6162 292c 0a09 666f 726d 6174 2827 7e2a 2b27 2c5b 5461 625d 292e 0a0a 7772 6974 655f 7668
4446720 646c 2876 6864 6c5f 7461 6269 6679 2854 6162 2929 203a 2d0a 0976 6864 6c5f 7461 6269 6679 2854 6162 292e 0a0a 7772 6974
4447000 655f 7668 646c 286c 6973 7428 4c69 7374 2929 203a 2d0a 0977 7269 7465 5f76 6864 6c5f 6c69 7374 284c 6973 7429 2e0a 2525
4447060 2525 2525 2525 2525 2525 2525 2525 2525 2525 2525 2525 2525 2525 2525 2525 2525 2525 2525 2525 2525 2525 2525 2525 2525
4447140 2525 2525 2525 2525 2525 2525 2525 2525 2525 2525 2525 2525 2525 250a 2525 2525 2057 7269 7465 2061 206c 6973 7420 6f66
4447220 2076 6864 6c20 656c 656d 656e 7473 0a0a 7772 6974 655f 7668 646c 285b 5d29 203a 2d20 212e 0a77 7269 7465 5f76 6864 6c28
4447300 5b45 6c65 6d65 6e74 7c52 6573 745d 2920 3a2d 0a09 666f 726d 6174 2827 7e70 272c 205b 456c 656d 656e 745d 292c 212c 0a09
4447360 7772 6974 655f 7668 646c 2852 6573 7429 2e0a 0a25 2525 2525 2525 2525 2525 2525 2525 2525 2525 2525 2525 2525 2525 2525
4447440 2525 2525 2525 2525 2525 2525 2525 2525 2525 2525 2525 2525 2525 2525 2525 2525 2525 2525 2525 2525 2525 2525 2525 2525
4447520 0a25 2525 2520 5772 6974 6520 6120 272c 2720 7365 7061 7261 7465 6420 6c69 7374 206f 6620 7668 646c 2065 6c65 6d65 6e74
4447600 7320 6672 5f6d 2061 206c 6973 740a 0a77 2c78 0020 0002 438a 45c4 3280 24d0 0000 0008 bb9c 0014 37f0 3cf4 234c 0016 4774
4447660 2954 001c 0002 438a 2520 35c8 4300 0000 0000 5eef 0011 ffe4 000c c5a8 2cac 0000 0002 438a 2ca0 0000 0000 0000 0000 0000
4447740 0019 dad4 0019 dad4 0019 dade 0019 d5a0 2cac 0000 0002 438a 2ca0 0000 0000 0000 0000 0001 0019 db44 0019 db44 0002 438a
4450020 001a 38a4 0019 db50 001a 409c 0100 8b87 0000 3287 0000 0004 0019 d294 0019 d294 0001 0045 0000 0000 2cac 0000 0002 438a
4450100 2ca0 0000 0000 0000 0000 0000 0019 dba8 0019 dba8 0019 dbb2 001a 38ec 0000 0000 0019 cf20 0000 0010 001a 392c 0000 0008
4450160 2cac 0000 0002 438a 2ca0 0000 0000 0000 0000 0001 0019 dc20 0019 dc20 0002 438a 001a 3924 0019 dc2c 0019 9fe0 0000 0008
4450240 2cac 0000 0002 438a 2ca0 0000 0000 0000 0000 0001 0019 dc84 0019 dc84 0002 438a 001a 3954 0019 dc90 001a 392c 0000 0008
4450320 2cac 0000 0002 438a 2ca0 0000 0000 0000 0000 0001 0019 dddc 0019 dddc 0002 438a 001a 3984 0019 dde8 0019 cb3c 0000 0018
4450400 001a 399c 0000 0008 001a 39cc 0000 0008 2cac 0000 0002 438a 2ca0 0000 0000 0000 0000 0000 0019 df00 0019 df00 0019 df0a
```

```
4450460  001a 39c4 0000 0000 001a 398c 0000 0018 001a 39dc 0000 0008 001a 3a0c 0000 0008 2cac 0000 0002 438a 2ca0 0000 0000 0000
4450540  0000 0000 0019 df64 0019 df64 0019 df6e 001a 3a04 0000 0000 001a 395c 0000 0008 2cac 0000 0002 438a 2ca0 0000 0000 0000
4450620  0000 0000 0019 73c0 0019 73c0 0019 73ca 001a 3a34 0000 0000 001a 3a0c 0000 0008 2cac 0000 0002 438a 2ca0 0000 0000 0000
4450700  0000 0001 0019 e00c 0019 e00c 0002 438a 001a 3a64 0019 e018 001a 39cc 0000 0018 001a 3a7c 0000 0008 001a 3aac 0000 0008
4450760  2cac 0000 0002 438a 2ca0 0000 0000 0000 0000 0001 0019 3138 0019 e128 0019 e132 001a 3aa4 0019 3144 001a 3a3c 0000 0008
4451040  0200 61bf b464 0010 000a 2bb8 0018 be18 2cac 0000 0002 438a 2ca0 0000 0000 0000 0000 0001 0019 d56c 001a 3ae8 001a 3af2
4451120  001a 3ae4 0019 d578 2954 0028 0002 438a 56f8 671c 682c 5758 6784 6a00 320c 247c 0015 acbc 0014 2ecc 2410 0000 0019 c7f4
4451200  001a 3aac 0000 0008 2cac 0000 0002 438a 2ca0 0000 0000 0000 0000 0000 0019 de40 0019 de40 0019 de4a 001a 3b3c 0000 0000
4451260  2c78 0018 0002 438a 3640 41e8 0000 000b 239c 0000 0019 ca50 001a 3b14 0000 0008 2cac 0000 0002 438a 2ca0 0000 0000 0000
4451340  0000 0001 0019 de6c 0019 e328 0019 e332 001a 3b84 0019 de78 001a 3b5c 0000 0008 2cac 0000 0002 438a 2ca0 0000 0000 0000
4451420  0000 0001 0019 d58c 0019 e3a4 0019 e3ae 001a 3bb4 0019 d598 001a 38f4 0000 0010 001a 3bd4 0000 0008 0004 636f 6e74 0000
4451500  001a 3a6c 0000 0018 001a 3be4 0000 0008 001a 3c28 0000 0008 27f0 0014 0019 e4ac 4e1c 0000 0000 0007 54a8 228c 2cac 0000
4451560  0002 438a 2ca0 0000 0000 0000 0000 0001 001a 3be8 0019 e4ac 0019 e4b6 001a 3c20 001a 3bf4 001a 3bbc 0000 0010 001a 3c40
4451640  0000 0008 0005 6675 316f 3100 001a 3b8c 0000 0008 2cac 0000 0002 438a 2ca0 0000 0000 0000 0000 0001 0019 e650 0019 e650
4451720  0002 438a 001a 3c68 0019 e65c 001a 3c40 0000 0008 2cac 0000 0002 438a 2ca0 0000 0000 0000 0000 0001 0019 e6b4 0019 e6b4
4452000  0002 438a 001a 3c98 0019 e6c0 001a 3c70 0000 0008 2c78 0018 0002 438a 3640 41e8 0000 000b 239c 0000 0019 cd18 001a 3ca0
4452060  0000 0008 27f0 0014 0019 e774 4e1c 0000 0000 0007 54f8 228c 2cac 0000 0002 438a 2ca0 0000 0000 0000 0000 0001 001a 3cc4
4452140  0019 e774 0019 e77e 001a 3cfc 001a 3cd0 001a 3cc0 0000 0008 27f0 0014 0019 e830 4e1c 0000 0000 0007 54f8 228c 2cac 0000
4452220  0002 438a 2ca0 0000 0000 0000 0000 0001 001a 3d08 0019 e830 0019 e83a 001a 3d40 001a 3d14 001a 3d04 0000 0008 2cac 0000
4452300  0002 438a 2ca0 0000 0000 0000 0000 0001 0019 e8b0 0019 e8b0 0002 438a 001a 3d70 0019 e8bc 001a 3d48 0000 0008 2cac 0000
4452360  0002 438a 2ca0 0000 0000 0000 0000 0001 0019 e944 0019 e944 0002 438a 001a 3da0 0019 e950 000b 7061 7274 6974 696f 6e65
4452440  7200 0008 2cac 0000 0002 438a 2ca0 0000 0000 0000 0000 0000 0019 eab0 0019 eab0 0019 eaba 001a 3dd8 0000 0000 001a 3bd4
4452520  0000 0018 001a 3df0 0000 0008 001a 3e34 0000 0008 2c78 0012 0002 438a 4e1c 0000 0000 0007 228c 0000 2cac 0000 0002 438a
4452600  2ca0 0000 0000 0000 0000 0001 001a 3df4 001a 3df4 0002 438a 001a 3e2c 001a 3e00 001a 3d78 0000 0008 27f0 0014 0019 ebb8
4452660  4e1c 0000 0000 0007 54f8 228c 2cac 0000 0002 438a 2ca0 0000 0000 0000 0000 0001 001a 3e38 0019 ebb8 0019 ebc2 001a 3e70
4452740  001a 3e44 001a 3de0 0000 0018 001a 3e88 0000 0008 001a 3ecc 0000 0008 27f0 0014 0019 ec48 4e1c 0000 0000 0007 54a8 228c
4453020  2cac 0000 0002 438a 2ca0 0000 0000 0000 0000 0001 001a 3e8c 0019 ec48 0019 ec52 001a 3ec4 001a 3e98 001a 3e78 0000 0018
4453100  001a 4098 0000 0010 0013 1580 0000 0000 2cac 0000 0002 438a 2ca0 0000 0000 0000 0000 0001 0019 ee94 0019 ee94 0002 438a
4453160  001a 3f04 0019 eea0 000a 6e65 775f 6465 7369 676e 001a 3ed0 2938 0014 0019 efb0 4e1c 0000 0000 0007 54f8 228c 27f0 0000
4453240  0019 efb0 2ca0 0000 0000 0000 0000 0001 001a 3f18 0019 efb0 0002 438a 001a 3f50 001a 3f24 2954 0000 0002 438a 2ca0 0000
4453320  0000 0000 0000 0000 0019 f0c8 0019 f19c 0019 d73c 001a 3f78 0000 0000 000d 6e65 775f 7668 646c 5f66 696c 6500 27f0 0014
4453400  0019 f22c 4e1c 0000 0000 0007 54a8 228c 2cac 0000 0002 438a 2ca0 0000 0000 0000 0000 0001 001a 3f8c 0019 f22c 0019 f236
4453460  001a 3fc4 001a 3f98 0000 8aff b328 0010 000a 2a58 0000 0000 27f0 0014 0019 f310 4e1c 0000 0000 0007 54f8 228c 2cac 0000
4453540  0002 438a 2ca0 0000 0000 0000 0000 0001 001a 3fd8 0019 f310 0019 f31a 001a 4010 001a 3fe4 0012 f1f4 0200 7a07 0000 3287
4453620  0000 0008 001a 43c8 001a 43c8 0001 0045 0000 0000 27f0 0014 0019 f3c4 4e1c 0000 0000 0007 5548 2edc 2cac 0000 0002 438a
4453700  2ca0 0000 0000 0000 0000 0001 001a 4034 001a 4070 0019 d718 001a 406c 001a 4040 2954 0014 0002 438a 56f8 5fa0 671c 22bc
4453760  0019 d3d4 0000 8aff b328 0010 000a 2a2c 0000 0000 001a 3e34 0000 0008 0017 a00c 0200 8b87 0000 3287 0000 0008 0013 14f0
4454040  0013 14f0 0001 0045 0000 0000 27f0 0024 0019 f4b0 48f8 5818 6750 5370 3050 4580 6b48 5370 4538 6bc8 6c34 22bc 0015 366c
4454120  2c78 0028 0002 438a 2520 247c 001a 44e4 000c 247c 001a 4504 000c 247c 001a 4524 000c 234c 001a 4544 001a 475c 0000 0064
4454200  0000 0060 001a 4118 001a 4128 0000 000c 001a 4124 001a 4134 0000 000c 001a 4130 001a 4140 0000 000c 001a 413c 001a 414c
4454260  0000 000c 001a 4148 001a 4158 0000 000c 001a 4154 001a 4164 0000 000c 001a 4160 001a 417c 0000 000c 001a 416c 0007 7274
4454340  6c68 2e70 6c00 0000 0000 0000 0004 6669 7665 0000 001a 4098 0000 0008 001a 3ab0 b464 ffff 000b 3980 001a 419c b464 15ad
4454420  000b 3b00 001a 41a8 b464 0000 000b 3b60 001a 41b4 b464 0000 000b 6b28 001a 41c0 b464 0000 000b 6f6c 001a 41cc b464 0000
4454500  000b 6fcc 001a 41d8 b464 0000 000b 702c 0000 0000 000b 6b7c 0019 d23c b464 0000 000b 80f4 001a 41f8 b464 0000 000b d140
4454560  001a 4204 b464 0000 000b 818c 001a 4210 b464 0000 000b 81d8 001a 421c b464 0000 000b 8224 001a 4228 b464 0000 000b 8270
4454640  001a 4234 b464 0000 000b 82bc 001a 4240 b464 0000 000b 8308 001a 424c b464 0000 000b 8354 0000 0000 0004 7265 6735 0000
4454720  0019 d0dc 0005 7460 7265 6590 0004 7265 6736 0000 b464 0000 000b 8450 001a 4290 0002 7536 0000 0000 0004 7265 6739 0000
4455000  b464 0000 000b 849c 001a 42ac 0002 7535 0000 0000 0004 7265 6738 0000 b464 0000 000b 84e8 001a 42c0 0002 7534 0000 0000
4455060  b464 0000 000b 8534 001a 42d4 0002 7533 0000 0000 b464 0000 000b 8580 001a 42e8 0002 7532 0000 0000 b464 0000 000b 85cc
4455140  001a 42fc 0002 7531 0000 0000 b464 0000 000b 8618 001a 4310 0005 7265 6731 3000 b464 0000 000b 8664 001a 4320 0001 7900
4455220  b464 0000 000b 86b0 001a 432c b464 0000 000b 86fc 001a 4338 b464 0000 000b 8748 001a 4344 b464 0000 000b 8794 001a 4350
4455300  b464 0000 000b 8b80 001a 435c b464 0000 000b 92f4 0000 0000 0009 6765 745f 6368 6172 7300 000f 636c 6561 725f 7668 646c
4455360  5f66 696c 6500 0000 0019 30d8 0000 000c 0000 0000 000e 636c 6561 725f 6461 7461 6261 7365 001a 4374 0000 0000 0018 4361
4455440  6e6e 6f74 2066 696e 6420 6669 6c65 2022 7e61 222e 7e6e 0000 2c78 0024 0002 438a 2520 46d8 24d0 0000 0008 dcdc 0010 39a4
4455520  0019 c610 000c 234c 0008 dd1c 0013 8020 0000 8bc7 0000 3287 0000 0000 0013 18b4 0013 18b4 0001 0045 0000 0000 2c78 0020
```

```
4455600  0002 438a 45c4 3280 24d0 0000 0008 c23c 0014 37f0 3cf4 234c 001a 443c 0019 c600 0200 8b97 0000 3287 0000 0008 001a 4458
4455660  001a 447c 0001 0045 0000 0000 001a 438c 0000 000c 0000 0000 27f0 0022 001a 447c 45b8 46ec 3b4c 0000 000c 6544 0014 2ecc
4455740  3788 56f8 6d0c 5370 723c 0000 2954 0024 0002 438a 5758 6b48 6840 3280 24d0 0000 0008 c23c 0014 37f0 3cf4 234c 001a 443c
4456020  0013 7ec4 0100 8b9f 0000 3287 0000 0004 000a 2a78 C00a 2a78 0001 0045 0000 0000 000e 7265 7365 745f 636f 756e 7465 7273
4456100  0000 0000 0013 7ee4 0000 9ba7 0000 3287 0000 0000 001a 4554 001a 4554 0001 0045 0000 0000 0013 7f04 0000 8baf 0000 3287
4456160  0000 0000 001a 45c4 001a 45c4 0001 0045 0000 0000 0013 7f48 0000 8bb7 0000 3287 0000 0000 001a 457c 001a 457c 0001 0045
4456240  0000 0000 0013 7f7c 0000 8bbf 0000 3287 0000 0000 0013 1a78 0013 1a78 0001 0045 0000 0000 2c78 0028 0002 438a 44a0 0000
4456320  0100 83bf 5fa0 43c0 0200 0daf 4b8c 0000 0000 3287 6bb4 22bc 0008 db9c 2c78 0028 0002 438a 44a0 0000 0200 2027 5f8c 43c0
4456400  0200 0daf 4b8c 0000 0000 3287 6bb4 22bc 0008 db9c 000f 636c 6561 725f 7363 6865 6475 6c65 7300 0000 0009 636c 6561 725f
4456460  6466 6700 2c78 0028 0002 438a 2520 247c 0012 5174 000c 247c 001a 43fc 000c 247c 001a 45fc 000c 234c 0014 0ee4 0013 80b8
4456540  0000 8bcf 0000 3287 0000 0000 0013 1954 0013 1954 0001 0045 0000 0000 0016 636c 6561 725f 636c 7573 7465 725f 656c 656d
4456620  656e 7473 0000 0000 000e 636c 6561 725f 6469 7374 616e 6365 0000 0000 0013 8168 0000 8bd7 0000 3287 0000 0000 0013 19b8
4456700  0013 19b8 0001 0045 0000 0000 0013 8188 0000 8bdf 0000 3287 0000 0000 001a 467c 001a 467c 0001 0045 0000 0000 2c78 0028
4456760  0002 438a 44a0 0000 0300 6b7f 5f78 43c0 0200 0daf 4b8c 0000 0000 3287 6bb4 22bc 0008 db9c 0013 8200 0100 8be7 0000 3287
4457040  0000 0004 001a 46cc 001a 46cc 0001 0045 0000 0000 001a 4188 0000 0008 2c78 0024 0002 438a 4568 5fa0 5370 4550 6b48 5bf4
4457120  4240 0000 0000 2daf 239c 0000 0008 e3fc 0003 6370 7500 0000 0013 8238 0100 8bef 0000 3287 0000 0004 0013 1c34 0013 1c34
4457200  0001 0045 0000 0000 0012 3978 0200 5367 0000 3287 0000 0008 0013 1cb0 0013 1cb0 0001 0045 0000 0000 001a 2a2a 2a2a 2a2a
4457260  2a2a 2a2a 2a2a 2a2a 2a2a 2a2a 2a2a 2a2a 2a2a 2a2a 0000 0000 0000 0000 0000 00ec 001a 4778 001a 477c 0000 0014 001a 4758
4457340  7fff ffff 0000 0000 001a 4788 0000 000c 001a 4784 001a 4794 0000 000c 001a 4790 001a 47a0 0000 000c 001a 479c 001a 47ac
4457420  0000 000c 001a 47a8 001a 47b8 0000 000c 001a 47b4 001a 47c4 0000 000c 001a 47c0 001a 47d0 0000 000c 001a 47cc 001a 47dc
4457500  0000 000c 001a 47d8 001a 47e8 0000 000c 001a 47e4 001a 47f4 0000 000c 001a 47f0 001a 4800 0000 000c 001a 47fc 001a 480c
4457560  0000 000c 001a 4808 001a 4818 0000 000c 001a 4814 001a 4824 0000 000c 001a 4820 001a 4830 0000 000c 001a 482c 001a 483c
4457640  0000 000c 001a 4838 0000 0000 0000 000c 001a 4844 0006 7275 6e2e 706c 001a 4850 5555 5555 0003 c6b4 0003 adc0 0001 ba40
4457720  001a 6f38 001a 6f7c 001a 85ec 001a 8710 001a 8710 0008 c4dc f7ff ebfc f7ff ebfc 001a a000 001a 9428 000a a000 001a 85f4
4460000  000c 8c17 0000 0013 001a 6f88 001a 874c 5555 5555 0000 06df 0000 022b 001a 6596 0000 036b 001a 659e 0000 030b 001a 65a6
4460060  0000 031b 001a 65ae 0000 039b 001a 65b6 0000 01d3 001a 65be 0000 017b 001a 65c6 0000 03a3 001a 65ce 0000 036b 001a 65d6
4460140  0000 0383 001a 65de 0000 017b 001a 65e6 0000 028b 001a 65ee 0000 0283 001a 65f6 0000 0393 001a 65fe 0000 037b 001a 6606
4460220  0000 0363 001a 660e 0000 037b 001a 6616 0000 033b 001a 661e 0000 01cb 001a 6626 0000 018b 001a 662e 0000 0193 001a 6636
4460300  0000 01b3 0000 0007 0000 01d3 0000 0007 0000 039b 001a 663e 0000 031b 001a 6646 0000 030b 001a 664e 0000 036b 001a 6656
4460360  0000 022b 001a 665e 0100 094f 0000 3787 0000 009b 0000 094f 0200 0ad7 0000 001f 0000 0007 0200 0db7 001a 666d 0000 315f
4460440  0055 2523 001a 66a1 001a 66aa 0100 3047 0000 002b 0000 1117 001a 66b2 0000 001f 001a 66ba 001a 66c1 0000 0007 0100 3047
4460520  0000 0083 0100 3047 0000 0033 0100 3047 0000 007b 0300 27bf 001a 669a 001a 66c9 001a 66d1 001a 66d1 0000 0007 001a 66c9
4460600  001a 66ea 001a 669a 001a 66f2 0000 2087 001a 66fa 0200 2257 0000 2cb7 0000 378f 0000 0013 0000 2257 0100 32b7 0000 3287
4460660  0200 0ad7 0000 004f 0000 0007 0200 0db7 001a 671d 0000 315f 003f 0163 0100 2167 003f 0163 0200 0ad7 0000 3287 0000 0007
4460740  0200 0db7 001a 6709 0000 315f 0055 2d03 0200 2257 0000 2daf 0000 06df 0200 0ad7 0000 3287 0000 0007 0200 0db7 001a 6765
4461020  0000 315f 0055 2d03 0100 2167 0055 2d03 0000 039b 001a 679e 0000 03ab 001a 67a6 0000 0373 001a 67ae 0000 01a3 001a 67b6
4461100  0000 016b 001a 67be 0000 01a3 001a 67c6 0000 0173 001a 67ce 0000 0183 0000 0007 0000 3237 0000 37a7 0000 4c73 0000 0193
4461160  001a 67ea 0000 0173 001a 67f2 0000 01ab 0000 0007 0000 37af 001a 683a 0000 0173 001a 67ce 0000 039b 001a 6812 0000 03ab
4461240  001a 681a 0000 0373 001a 6822 0000 01a3 001a 682a 0000 016b 001a 6832 0000 01a3 0000 0007 0000 37b7 001a 686a 0000 016b
4461320  001a 6832 0000 039b 001a 6852 0000 03ab 001a 685a 0000 0373 001a 6862 0000 01a3 0000 0007 0000 06df 0000 0007 0000 3797
4461400  001a 67fa 0200 2257 0000 3037 0000 3797 0200 0ad7 0000 3287 0000 0007 0200 0db7 001a 6879 0000 315f 0055 2d03 0100 2167
4461460  0055 2d03 0200 2257 0000 3037 0000 37af 0200 0ad7 0000 3287 0000 0007 0200 0db7 001a 68a9 0000 315f 0055 2d03 0100 2167
4461540  0055 2d03 0200 2257 0000 3037 0000 37b7 0200 0ad7 0000 3287 0000 0007 0200 0db7 001a 68d9 0000 315f 0055 2d03 0100 2167
4461620  0055 2d03 0200 2257 0000 3037 0000 06df 0200 0ad7 0000 3287 0000 0007 0200 0db7 001a 6909 0000 315f 0055 2d03 0100 2167
4461700  0055 2d03 0000 038b 0000 0007 0000 038b 001a 67e2 0000 244f 0000 0007 0000 37bf 001a 694a 0000 038b 001a 6962 0000 0193
4461760  001a 696a 0000 0173 001a 6972 0000 01ab 0000 0007 0000 017b 001a 695a 0000 017b 001a 698a 0000 038b 001a 6992 0000 0193
4462040  001a 699a 0000 0173 001a 69a2 0000 01ab 001a 69ea 0000 0343 001a 69b2 0000 032b 001a 69ba 0000 0363 001a 69c2 0000 0383
4462120  001a 69ca 0000 039b 001a 69d2 0000 03cb 001a 69da 0000 039b 0000 0007 0000 017b 001a 69aa 0000 017b 001a 69f2 0000 0343
4462200  001a 69fa 0000 032b 001a 6a02 0000 0363 001a 6a0a 0000 0383 001a 6a12 0000 039b 001a 6a1a 0000 03cb 001a 6a22 0000 039b
4462260  0000 0007 0000 033b 001a 6a32 0000 032b 001a 6a3a 0000 0373 001a 6a42 0000 032b 001a 6a4a 0000 0393 001a 6a52 0000 034b
4462340  001a 6a5a 0000 031b 0000 0007 0000 033b 001a 6a6a 0000 032b 001a 6a72 0000 0373 001a 6a7a 0000 032b 001a 6a82 0000 0393
4462420  001a 6a8a 0000 034b 001a 6a92 0000 031b 001a 6982 0100 2cb7 0000 37c7 0200 2257 0000 244f 001a 6a99 0200 0ad7 0000 3287
4462500  0000 0007 0200 0db7 001a 6aa1 0000 315f 0055 2d03 0100 2167 0055 2d03 0000 0313 0000 0007 0000 034b 001a 6ad2 0000 0363
4462560  001a 6ada 0000 0383 001a 6ae2 0000 038b 001a 6aea 0000 038b 001a 6b02 0000 0383 001a 6b0a 0000 0363 001a 6b12 0000 034b
4462640  001a 6b1a 0000 0313 001a 67e2 0000 37cf 0000 0007 0000 038b 001a 6b32 0000 0383 001a 6b3a 0000 0363 001a 6b42 0000 034b
```

```
4462720 001a 6b4a 0000 0313 001a 6b52 0000 0193 001a 6b5a 0000 0173 001a 6b62 0000 01ab 0000 0007 0000 017b 001a 6b2a 0000 017b
4463000 001a 6b7a 0000 038b 001a 6b82 0000 0383 001a 6b8a 0000 0363 001a 6b92 0000 034b 001a 6b9a 0000 0313 001a 6ba2 0000 0193
4463060 001a 6baa 0000 0173 001a 6bb2 0000 01ab 0000 0007 0000 033b 001a 6bc2 0000 032b 001a 6bca 0000 0373 001a 6bd2 0000 032b
4463140 001a 6bda 0000 0393 001a 6be2 0000 034b 001a 6bea 0000 031b 0000 0007 0000 033b 001a 6bfa 0000 032b 001a 6c02 0000 0373
4463220 001a 6c0a 0000 032b 001a 6c12 0000 0393 001a 6c1a 0000 034b 001a 6c22 0000 031b 001a 6b72 0100 2cb7 0000 37d7 0200 2257
4463300 0000 2caf 001a 6c29 0200 0ad7 0000 3287 0000 0007 0200 0db7 001a 6c31 0000 315f 0055 2d03 0100 2167 0055 2d03 0200 2257
4463360 0000 2677 001a 6c68 0100 267f 001a 6c68 0200 0db7 001a 6c61 001a 6c6d 0200 0ad7 0000 3287 0000 0007 0200 095f 0055 41a3
4463440 001a 6c6d 0200 0db7 001a 6c61 001a 6c8d 0055 2d03 0100 2167 0055 2d03 0100 2caf 0000 2677 0100 257f 001a 6cb1 0000 000b
4463520 0000 267f 0100 32b7 0000 3287 0200 0db7 001a 6cc9 0000 315f 0200 0db7 001a 6ce9 0000 315f 0100 32b7 0000 3287 0200 0ad7
4463600 0000 3287 0000 0007 0200 0db7 001a 6cb9 0000 315f 0055 45c3 0100 2caf 0000 30ff 0100 267f 001a 6d0d 0200 0ad7 0000 3287
4463660 0000 0007 0200 0db7 001a 6d15 0000 315f 0055 45c3 0100 2167 0055 45c3 0000 0003 0000 2dff 0200 0ad7 0000 001f 0000 0007
4463740 0200 0db7 0000 2dff 0000 315f 0000 0003 001a 6d6d 001a 6d76 0100 3047 0000 002b 0000 1117 001a 6d7e 0000 001f 001a 6d86
4464020 001a 6d8d 0000 0007 0100 3047 0000 0083 0100 3047 0000 0033 0100 3047 0000 007b 0300 27bf 001a 6d66 001a 6d95 001a 6d9d
4464100 001a 6d9d 0000 0007 001a 6d95 001a 6db6 001a 6d66 001a 6dbe 0000 2087 001a 6dc6 0100 31b7 001a 6dd8 0100 31b7 0000 3287
4464160 0200 0ad7 0000 004f 0000 0007 0200 0db7 001a 6ddd 0000 315f 003f 2923 0100 31b7 0000 3287 0200 0db7 001a 6e01 0000 315f
4464240 0200 0db7 001a 6e21 0000 315f 0100 31b7 0000 3287 0100 3047 0000 00cb 0100 3047 0000 0033 0100 3047 0000 007b 0300 27bf
4464320 001a 6e29 001a 6e31 001a 6e39 001a 6e39 0000 0007 001a 6e31 001a 6e52 001a 6e29 001a 6e5a 0000 2087 001a 6e62 001a 6e70
4464400 1000 32cf 001a 6e78 001a 6e7c 001a 6e80 001a 6e84 001a 6e88 001a 6e8c 001a 6e90 001a 6e94 001a 6e98 001a 6e9c 001a 6ea0
4464460 001a 6ea4 001a 6ea8 001a 6eac 001a 6eb0 001a 6eb4 0100 1d8f 0000 2dcf 001a 6eb9 001a 6eca 0000 0a0f 001a 6eda 0100 1d8f
4464540 0000 8c0f 001a 6ed1 001a 6ee2 0000 0a7f 0000 0007 0000 0a7f 0000 0007 0000 8c0f 0000 0007 0000 2dcf 001a 6ef2 0100 2dcf
4464620 0000 8c0f 0000 0007 0100 31b7 0000 3287 0200 0db7 001a 6f0d 0000 315f 0200 0db7 001a 6f2d 0000 315f 0100 31b7 0000 3287
4464700 0000 2dcf 0400 242f 0000 2dcf 0000 000b 0000 001f 0000 1e7f 0200 0db7 001a 6f39 0000 315f 0200 0db7 001a 6f65 0000 315f
4464760 0400 242f 0000 2dcf 0000 000b 0000 001f 0000 1e7f 001a 6f78 5555 5555 001a 864c 001a 8648 000a 1910 0000 0000 0000 0000
4465040 0000 0000 0000 0000 0000 0000 0021 b0cc 0007 61dc 001a 85f4 000a 190a 001a 85f4 001a 6588 0021 b0cc 0007 61dc 001a 85f4
4465120 001a 8624 000a 1908 001a 8624 001a 8630 0005 77a0 001a 8624 001a 6f01 0000 0007 0000 2a17 0000 3427 0000 341f 0000 0003
4465200 0008 dadc 0000 0000 001a 6e31 001a 8654 001a 8658 0000 2a17 001a 863c 0005 79c0 001a 8624 0003 ae84 001a 85f4 001a 6e70
4465260 001a 863c 0005 7a40 001a 8690 0008 941c 0000 0000 0000 2a17 0000 0007 0000 3287 001a 6f01 001a 8690 0005 7e44 001a 8690
4465340 0005 7fd0 001a 85ec 001a 6f34 001a 8690 0005 7e44 001a 8690 0000 0007 0000 0007 0008 811c 0000 0000 0000 0007 0000 2a17
4465420 0000 3287 001a 6f01 001a 86cc 0005 7fb0 001a 86cc 0005 800c 001a 85ec 001a 6f38 001a 86cc 0005 7fb0 001a 8710 001a 6f78
4465500 0000 3287 0000 8c17 001a 8710 0003 adb0 001a 8710 001a 8734 001a 8738 0000 2de7 001a 8728 0003 b524 001a 8710 0003 b54c
4465560 001a 85ec 001a 6f7c 001a 8728 0003 b534 001a 8758 001a 6f7d 0046 26e3 0000 001b 0000 3287 001a 6f94 0000 0b23 001a 8740
4465640 0003 0654 001a 8740 0003 91b4 001a 85ec 001a 6f78 001a 8740 0003 0654 001a 8740 0000 000b 001a 6f01 001a 6f79 001a 8750
4465720 0000 3287 0000 0007 0000 2dcf 001a 8794 0003 918c 001a 8794 001a 6f81 0046 61e3 0000 001b 001a 8798 001a 6f94 0000 0d03
4466000 0000 001b 001a 8788 001a 6f54 0000 0d23 0008 c47c 0007 a7fa 0000 13fe 001a 6f4d 001a 87cc 0003 0a1c 001a 8798 000a 320c
4466060 001a 85ec 001a 6f58 001a 87cc 001a 6f59 001a 85f4 001a 6ee8 001a 8788 0003 d8d8 001a 8704 0000 8c0f 001a 6ef0 001a 883c
4466140 001a 6ee2 0000 1f3b 001a 87b0 001a 87b4 001a 8828 0003 d964 001a 8828 001a 6ef4 001a 8838 001a 883c 001a 7ac1 0100 2acf
4466220 0000 000b 0100 2a97 0000 001b 0100 2acf 0000 000b 0100 2a97 0000 001b 0100 2acf 0000 000b 0100 2a97 0000 001b 0100 2acf
4466300 0000 0013 0100 2acf 0000 000b 0100 2a97 0000 001b 0100 2acf 0000 001b 0000 000b 001a 88b5 0000 000b 001a 88cd 0100 2acf
4466360 0000 0013 0100 2a97 0000 0023 0100 2acf 0000 000b 0100 2a97 0000 0023 0100 2acf 0000 0013 0100 2acf 0000 000b 0100 2a97
4466440 0000 0023 0100 2acf 0000 000b 0100 2a97 0000 0023 0100 2acf 0000 000b 0100 2acf 0000 0013 0200 0ad7 001a 817d 001a 7b9d
4466520 0100 2acf 0000 001b 0200 0ad7 001a 81a9 001a 7b61 0100 2acf 0000 0013 0100 2acf 0000 001b 0000 000b 001a 894d 001a 8171
4466600 0000 0007 001a 8191 001a 895e 001a 81c1 001a 8966 001a 81f1 001a 896e 001a 8211 001a 8976 001a 8231 001a 897e 001a 8251
4466660 001a 8986 001a 8271 001a 898e 001a 8291 001a 8996 001a 82b1 001a 899e 001a 82d5 001a 89a6 001a 82f5 001a 89ae 001a 8315
4466740 001a 89b6 001a 8339 001a 89be 001a 8359 001a 89c6 001a 8379 001a 89ce 001a 839d 001a 89d6 001a 83c1 001a 89de 001a 83e1
4467020 001a 89e6 001a 8405 001a 89ee 001a 8425 001a 89f6 001a 8445 001a 89fe 001a 8465 001a 8a06 0100 08af 0000 02bf 0200 0ad7
4467100 001a 8451 001a 8a15 001a 8a1d 0000 0007 0300 08af 0000 1ea7 001a 8101 001a 8875 0200 0ad7 0000 0a87 001a 8a31 001a 8a41
4467160 001a 8a2a 001a 8425 001a 8a4e 001a 8405 001a 8a56 001a 83e1 001a 8a5e 001a 83c1 001a 8a66 001a 839d 001a 8a6e 001a 8379
4467240 001a 8a76 001a 8359 001a 8a7e 001a 8339 001a 8a86 001a 8315 001a 8a8e 001a 82f5 001a 8a96 001a 82d5 001a 8a9e 001a 82b1
4467320 001a 8aa6 001a 8291 001a 8aae 001a 8271 001a 8ab6 001a 8251 001a 8abe 001a 8231 001a 8ac6 001a 8211 001a 8ace 001a 81f1
4467400 001a 8ad6 001a 81c1 001a 8ade 001a 8191 001a 8ae6 001a 8171 001a 8ace 0300 08af 0000 23b7 001a 8b0d 001a 8b15 0100 3077
4467460 0000 000b 0100 3077 5555 5555 001a 8710 f7ff f430 0001 a578 0000 0000 0000 0000 0000 0000 001a 8750 0000 0007 001a 87b4
4467540 0000 0007 0021 b294 0000 000b 0000 0007 001a da28 001a da24 322f 622f 7175 696e 7475 732f 6269 6e32 2e35 2f73 756e 342d
4467620 342e 302f 7072 6f77 696e 646f 7773 0000 0000 0000 0000 0000 0000 0000 0000 0000 0000 0000 0000 0000 0000 0000 0000 0000
4467700 0000 0000 0000 0000 2f75 7372 2f73 6861 7265 2f6c 6962 2f7a 6f6e 6569 6e66 6f2f 6c6f 6361 6c74 696d 6500 0000 0000 0000
4467760 0000 0000 0000 0000 0000 0000 0000 0000 0000 0000 0000 0000 0000 0000 0000 0000 0000 0000 0000 0000 0000 0000 0000 0000
```

```
4470560 0000 0000 0000 0000 0000 0000 0000 0000 0000 0000 0000 0000 0000 0008 f77d bfd8 f77d e51c 0000 3222 0000 0000 0000 0000
4470640 0000 0000 0000 0000 0000 0000 0000 0000 0000 0000 0000 0000 0000 0000 0000 0000 0000 0000 0000 0000 0000 0000 0000 0000
4470720 0000 0000 0000 0000 0000 0000 f77d ec53 f7ff eebc 0000 0000 ffff ffea f77d bfd8 f77d e51c 0000 3357 0000 0000 f780 2e98
4471000 0000 0000 0000 0000 0000 0000 0000 0000 0000 0000 0000 0000 0000 0000 0000 0000 0000 0000 0000 0000 0000 0000 0000 0000
4471060 0000 0000 0000 0000 0000 0000 f77d ec5b f7ff ef1c 0000 0000 0000 0000 0000 0000 0000 0000 0000 0000 0000 0000 f780 2e98
4471140 0000 0000 0000 0000 0000 0000 0000 0000 0000 0000 0000 0000 0000 0000 0000 0000 0000 0000 0000 0000 0000 0000 0000 0000
4471220 0000 0031 f77d bfd8 f77d e51c 0000 046f 0000 0000 0000 0000 0000 0000 0000 0000 0000 0000 0000 0000 0000 0000 0000 0000
4471300 0000 0000 0000 0000 0000 0000 0000 0000 0000 0000 0000 0000 0000 0000 0000 0000 3833 3039 6137 3230 f7ff efc4 0000 0000
4471360 0000 000c f77d bfd8 f77d e51c 000c 814b ffff ffed f77d bfd8 f77d e51c 0000 0c3a 0000 0000 0000 0000 0000 0000 0000 0000
4471440 0000 001d f779 f210 7fff ffff f7ff f040 0000 0003 0000 005b 0000 0001 f77e 205c f7ff f1a4 0007 8ad4 000a 4931 f779 e1f9
4471520 7fff ffff 0000 005b f7ff f140 f779 d190 0000 0003 f77d bfd8 f77d e51c 0000 182f 686f 6d65 2f6f 7361 7331 2f61 2f76 696a
4471600 6179 2f62 696e 2f70 726f 7769 6e64 6f77 7300 0000 0000 0000 0000 0000 0000 0000 0000 0000 0000 0000 0000 0000 0000 0000
4471660 0000 0000 f77d e780 f7ff f094 0000 0000 0000 0007 f77d bfd8 f77d e51c 0000 3117 0007 442c f780 2e98 f77f ac34 0000 0003
4471740 0000 07f8 0000 0550 f7ff f040 f77f a05c 0007 4220 0006 f8e8 7fff ffd5 0007 1d0d 0000 0001 f780 0000 f7ff f0f8 f77f 207c
4472020 0000 0000 0007 1d0d f7ff f0f4 0000 0000 0000 0000 0000 0000 0000 0000 0000 0000 0000 0000 f780 2e98 0000 0032 f779 f210
4472100 7fff ffff f7ff f040 0000 0004 0000 005b 0000 0001 f77e 205c 0000 0020 0000 003b 0000 0023 0000 0020 ffff ffff 0000 003b
4472160 f7ff f158 0007 4220 0000 0000 0000 0000 0000 0005 0000 0001 f779 e304 0000 0000 0000 0002 f77e 56a1 0000 0009 0000 0001
4472240 0000 0013 0000 0000 0000 0680 0000 0030 f7ff f2ad 0000 04e0 000a 5384 0000 0000 000a 5384 0000 0004 0000 0031 0000 0000
4472320 f7ff f1b8 0002 1da4 0000 ff00 0000 0000 0000 0000 0000 0001 f7ff f2f1 f7ff f2ad 0000 0045 0041 539e 10df 28ac 0000 0023
4472400 0000 0024 f7ff f221 0000 ffff 0000 b484 000a 5384 0000 0003 0004 a9d1 000a 5c38 2200 122d 0000 0000 f7ff f2ad 0000 0001
4472460 f7ff f430 0001 a548 0000 0000 0000 0000 0000 0000 f7ff f2a8 f7ff f2a4 f7ff f2a0 f7ff f221 f780 0c50 0000 000d 0000 a9d1
4472540 f720 2020 236f 7361 636c 3139 2032 3230 3031 3232 6420 7170 2670 7720 2839 2f31 322f 3839 2920 3179 6561 7200 2f38 3929
4472620 0000 0000 0000 0000 0000 000e f77d bfd8 f77d e51c 0000 626d 0000 0040 f77d ea14 f7ff f28c f77f a05c f780 0064 0000 0001
4472700 0000 0001 0007 21c1 f7ff f2a4 0007 1e58 f7ff f2ac 0000 0003 f780 2e30 f7ff f305 8309 a720 6cdf 8743 0d9c c0bf f730 6439
4472760 6363 3062 6620 3663 6466 3837 3433 2038 3330 3961 3732 3020 2020 236f 7361 636c 3139 2032 3230 3031 3232 6420 7170 2670
4473040 7720 2939 2f31 322f 3839 2920 3179 6561 720a 0038 3929 0a00 0000 0000 ffff efb4 000a a000 0000 6000 0000 0a0b 0000 0000
4473120 001a 6f54 001a 6f54 f7ff f340 0001 9668 0000 0003 0000 0080 f7ff f350 0d9c c0bf 2f68 6f6d 652f 6f73 ffff ffff f77d bfd8
4473200 f77d e51c 0000 3302 6465 7300 8101 0100 0007 879e 0006 7070 0000 2800 0000 0000 0000 0075 00a0 0000 f7ff f370 000a a072
4473260 0008 ecec 0100 0000 0009 244c 0009 ecec 000a 5400 0000 053c 00a0 0000 0007 1e20 f7ff f3ac 001f e000 0000 2800 000a a05e
4473340 0000 0000 0000 06ec f7ff f3d0 f780 2e98 000a 6800 0000 1854 000a 6800 0000 5000 000a a000 0000 6000 000a 6800 0000 0000
4473420 000a 1998 0007 9000 000a a000 000a a000 000a a058 0000 0004 0000 0006 0000 0001 0000 000a 000a b6b8 0000 0000 0000 0000
4473500 0002 cca8 000a 5e80 f7ff f430 0021 b538 5555 5555 0103 0107 0000 0000 0000 0000 0000 0000 0000 2d18 0016 c000 0000 0000
4473560 0000 0000 0000 0004 0600 0000 0017 70f8 0000 000e 0400 0000 0016 c000 0000 0018 0600 0000 0015 a218 0000 0022 0400 0000
4473640 0015 8800 0000 002c 0600 0000 0015 24f8 0000 0036 0400 0000 0014 9000 0000 0040 0600 0000 000f 2520 0000 004a 0400 0000
4473720 000e 8800 0000 0054 0600 0000 000e 7100 0000 005e 0400 0000 000e 7000 0000 0068 0600 0000 000d 1e50 0000 0072 0400 0000
4474000 000d 1c00 0000 007c 0600 0000 000d 15e0 0000 0086 0400 0000 000d 1400 0000 0090 0600 0000 000b db28 0000 009a 0400 0000
4474060 000b d800 0000 00a4 0600 0000 0007 4000 0000 00ae 0400 0000 0000 2020 0000 00b5 0400 0000 0000 2288 0000 00bd 0400 0000
4474140 0002 4388 0000 00c8 0400 0000 0006 de30 0000 00d4 0600 0000 000a 460c 0000 00de 0800 0000 000a 8c6c 0000 00f3 0600 0000
4474220 000a 4614 0000 00fc 0800 0000 000a 7c50 0000 0106 0800 0000 000a 7c5c 0000 011a 0800 0000 000a 8c78 0000 012e 0600 0000
4474300 000a 4610 0000 0138 0800 0000 000a 7c58 0000 0149 0800 0000 000a 8c74 0000 015a 0800 0000 000a 7c64 0000 016d 0800 0000
4474360 000a 7c54 0000 0178 0600 0000 000a 4600 0000 018b 0800 0000 000a 8c70 0000 019e 0400 0000 0006 f2d8 0000 01a8 0600 0000
4474440 000a 4900 0000 01b0 0600 0000 000a 491c 0000 01b6 0800 0000 000a 8c84 0000 01bc 0800 0000 000a 8c80 0000 01c2 0400 0000
4474520 0006 f738 0000 01cb 0400 0000 0006 f738 0000 01d4 0400 0000 0006 f738 0000 01da 0400 0000 0006 f738 0000 01e2 0400 0000
4474600 000b d800 0000 01ef 0400 0000 000b d800 0000 01f9 0600 0000 000b db50 0000 0201 0400 0000 000b da00 0000 020c 0400 0000
4474660 000b d9e4 0000 0217 0400 0000 000b d9dc 0000 021f 0400 0000 000b d928 0000 0227 0400 0000 000b d8d8 0000 022f 0400 0000
4474740 000d 1400 0000 023c 0400 0000 000d 1400 0000 0246 0600 0000 000d 15e8 0000 024e 0600 0000 000d 1604 0000 0255 0800 0000
4475020 000d 160c 0000 025a 0800 0000 000d 1608 0000 0260 0400 0000 000d 1570 0000 026c 0400 0000 000d 1588 0000 0272 0400 0000
4475100 000d 1598 0000 0279 0400 0000 000d 15b0 0000 027f 0400 0000 000d 15c0 0000 0288 0400 0000 000d 15d0 0000 0292 0400 0000
4475160 000d 1c00 0000 029f 0400 0000 000d 1c00 0000 02a7 0600 0000 000d 1e68 0000 02af 0400 0000 000d 1d88 0000 02b7 0400 0000
4475240 000d 1da0 0000 02bd 0400 0000 000d 1db0 0000 02c5 0400 0000 000d 1dc8 0000 02cb 0400 0000 000d 1dd8 0000 02d2 0400 0000
4475320 000d 1df0 0000 02d8 0400 0000 000d 1e00 0000 02e1 0400 0000 000d 1e18 0000 02e7 0400 0000 000d 1e28 0000 02f0 0400 0000
4475400 000d 1e40 0000 02f6 0400 0000 000e 7000 0000 0303 0400 0000 000e 7000 0000 0309 0600 0000 000e 7110 0000 0311 0400 0000
4475460 000e 8800 0000 031e 0400 0000 000e 8800 0000 0325 0600 0000 000f 25e0 0000 032d 0600 0000 000f 25e8 0000 0335 0600 0000
4475540 000f 25c0 0000 033d 0400 0000 000e 95b0 0000 0344 0400 0000 000e 95d0 0000 034c 0400 0000 000e 9658 0000 0358 0400 0000
```

```
4475620  000e 96e8 0000 0360 0400 0000 000e 97b8 0000 0367 0400 0000 000e 9808 0000 036d 0400 0000 000e a668 0000 0374 0400 0000
4475700  000e a800 0000 037b 0400 0000 000e aa28 0000 0384 0400 0000 000e bd80 0000 038d 0400 0000 000e c368 0000 0395 0400 0000
4475760  000e c528 0000 03a1 0400 0000 000e c6c8 0000 03a8 0400 0000 000e c928 0000 03af 0400 0000 000e cba8 0000 03b7 0400 0000
4476040  000e d0d8 0000 03be 0400 0000 000e d488 0000 03c4 0400 0000 000e d710 0000 03cb 0400 0000 000e d940 0000 03d2 0400 0000
4476120  000e db40 0000 03da 0400 0000 000e e2a8 0000 03e0 0400 0000 000e e568 0000 03e7 0400 0000 000e eeb0 0000 03f2 0400 0000
4476200  000e f1b0 0000 0402 0400 0000 000e ff68 0000 040e 0400 0000 000f 03c0 0000 0416 0400 0000 000f 0898 0000 041d 0400 0000
4476260  000f 0bc8 0000 042d 0400 0000 000f 1d28 0000 0437 0400 0000 000f 1130 0000 043e 0400 0000 000f 2010 0000 0444 0400 0000
4476340  000f 22c8 0000 044f 0400 0000 000f 24f8 0000 0457 0400 0000 000f 2510 0000 045d 0400 0000 0014 9000 0000 046a 0400 0000
4476420  0014 900c 0000 0474 0600 0000 0015 2560 0000 047c 0800 0000 0015 2c5c 0000 0485 0600 0000 0015 2984 0000 048e 0600 0000
4476500  0015 2980 0000 0492 0600 0000 0015 297c 0000 0496 0800 0000 0015 2a40 0000 04a3 0400 0000 0014 a4c8 0000 04a9 0400 0000
4476560  0014 a780 0000 04b0 0400 0000 0014 a7a0 0000 04b7 0400 0000 0014 a870 0000 04be 0400 0000 0014 a928 0000 04c7 0400 0000
4476640  0014 a9f0 0000 04d0 0400 0000 0014 ab00 0000 04df 0400 0000 0014 bba8 0000 04ea 0400 0000 0014 be30 0000 04f8 0400 0000
4476720  0014 d2f0 0000 0507 0400 0000 0014 e7e0 0000 0514 0400 0000 0014 f2b8 0000 0524 0400 0000 0014 f7e8 0000 0533 0400 0000
4477000  0014 fbf8 0000 053d 0400 0000 0014 fc48 0000 0545 0400 0000 0014 fc80 0000 054c 0400 0000 0014 fca0 0000 0555 0400 0000
4477060  0014 fcb8 0000 055b 0400 0000 0014 fcc8 0000 0563 0400 0000 0014 fce0 0000 0569 0400 0000 0014 fcf0 0000 0572 0400 0000
4477140  0014 fd20 0000 057a 0400 0000 0014 fd28 0000 0586 0400 0000 0014 ff48 0000 0592 0400 0000 0015 0178 0000 059b 0400 0000
4477220  0015 15e0 0000 05a4 0400 0000 0015 1be8 0000 05ac 0400 0000 0015 1c00 0000 05b2 0400 0000 0015 1c10 0000 05bb 0400 0000
4477300  0015 1d00 0000 05c4 0400 0000 0015 1d40 0000 05cd 0400 0000 0015 1d70 0000 05d8 0400 0000 0015 2198 0000 05e2 0400 0000
4477360  0015 24a8 0000 05f2 0400 0000 0015 24c0 0000 05f8 0400 0000 0015 24d0 0000 0600 0400 0000 0015 24e8 0000 0606 0400 0000
4477440  0015 8800 0000 0613 0400 0000 0015 8800 0000 061a 0600 0000 0015 a230 0000 0622 0400 0000 0015 8ca4 0000 0629 0400 0000
4477520  0015 8bfc 0000 0630 0400 0000 0015 8b84 0000 0637 0600 0000 0015 a29c 0000 063c 0400 0000 0015 88b8 0000 0644 0600 0000
4477600  0015 a250 0000 0649 0600 0000 0015 a26c 0000 064e 0400 0000 0015 9240 0000 065a 0400 0000 0015 9d60 0000 0663 0400 0000
4477660  0015 9d98 0000 066a 0400 0000 0015 9dd8 0000 0673 0400 0000 0015 9df0 0000 0679 0400 0000 0015 9ec0 0000 0688 0400 0000
4477740  0015 9e18 0000 068e 0400 0000 0015 9e28 0000 0695 0400 0000 0015 9e40 0000 069b 0400 0000 0015 9e50 0000 06a4 0400 0000
4500020  0015 a170 0000 06ad 0400 0000 0016 c000 0000 06ba 0400 0000 0016 c000 0000 06c6 0600 0000 0017 7118 0000 05ce 0600 0000
4500100  0017 713c 0000 06d7 0800 0000 0017 7818 0000 06dd 0800 0000 0017 7410 0000 06e4 0800 0000 0017 7814 0000 06eb 0400 0000
4500160  0016 c148 0000 06f4 0600 0000 0017 7140 0000 06fa 0600 0000 0017 7148 0000 0702 0600 0000 0017 7144 0000 0707 0800 0000
4500240  0017 781c 0000 070f 0600 0000 0017 7138 0000 0715 0400 0000 0016 c868 0000 071e 0400 0000 0016 cb28 0000 0729 0400 0000
4500320  0016 cb60 0000 0734 0400 0000 0016 da40 0000 073f 0400 0000 0016 edb8 0000 0747 0400 0000 0016 f720 0000 0750 0400 0000
4500400  0016 f810 0000 0759 0400 0000 0016 fe30 0000 0763 0400 0000 0016 ff20 0000 076d 0400 0000 0017 0000 0000 0777 0400 0000
4500460  0017 0060 0000 0781 0400 0000 0017 00a8 0000 078a 0400 0000 0017 02f8 0000 0798 0400 0000 0017 0868 0000 07a2 0400 0000
4500540  0017 1238 0000 07aa 0400 0000 0017 1378 0000 07b2 0400 0000 0017 1590 0000 07b8 0400 0000 0017 15e8 0000 07c1 0400 0000
4500620  0017 1730 0000 07c9 0400 0000 0017 18d0 0000 07d3 0400 0000 0017 19a0 0000 07db 0400 0000 0017 19b8 0000 07e1 0400 0000
4500700  0017 19c8 0000 07ed 0400 0000 0017 19e0 0000 07f3 0400 0000 0017 19f0 0000 07fe 0400 0000 0017 1a08 0000 0804 0400 0000
4500760  0017 1a18 0000 0812 0400 0000 0017 1a30 0000 0818 0400 0000 0017 1a40 0000 0821 0400 0000 0017 1a58 0000 0827 0400 0000
4501040  0017 1a68 0000 082f 0400 0000 0017 1a80 0000 0835 0400 0000 0017 1a90 0000 083d 0400 0000 0017 1aa8 0000 0843 0400 0000
4501120  0017 1ab8 0000 084a 0400 0000 0017 1ae8 0000 0852 0400 0000 0017 1b00 0000 0858 0400 0000 0017 1b10 0000 0862 0400 0000
4501200  0017 2ab8 0000 086c 0400 0000 0017 3590 0000 0877 0400 0000 0017 3c60 0000 087f 0400 0000 0017 3f40 0000 088a 0400 0000
4501260  0017 4068 0000 0891 0400 0000 0017 4248 0000 0899 0400 0000 0017 4428 0000 08a1 0400 0000 0017 4460 0000 08ab 0400 0000
4501340  0017 4490 0000 08b5 0400 0000 0017 4500 0000 08be 0400 0000 0017 4d30 0000 08c6 0400 0000 0017 4eb8 0000 08d1 0400 0000
4501420  0017 58a8 0000 08e1 0400 0000 0017 58e0 0000 08f0 0400 0000 0017 5a38 0000 08fc 0400 0000 0017 5aa0 0000 0907 0400 0000
4501500  0017 5ee8 0000 090d 0400 0000 0017 66b8 0000 0917 0400 0000 0017 68f0 0000 0922 0400 0000 0017 6930 0000 0929 0400 0000
4501560  0017 6948 0000 092f 0400 0000 0017 6958 0000 0939 0400 0000 0017 6970 0000 093f 0400 0000 0017 6980 0000 0945 0400 0000
4501640  0017 6998 0000 094b 0400 0000 0017 69a8 0000 0952 0400 0000 0017 69c0 0000 0958 0400 0000 0017 69d0 0000 0960 0400 0000
4501720  0017 69e8 0000 0966 0400 0000 0017 69f8 0000 0976 0400 0000 0017 6a10 0000 097c 0400 0000 0017 6a20 0000 098a 0400 0000
4502000  0017 6a38 0000 0990 0400 0000 0017 6a48 0000 099b 0400 0000 0017 6a60 0000 09a1 0400 0000 0017 6a70 0000 09aa 0400 0000
4502060  0017 6a88 0000 09b0 0400 0000 0017 6a98 0000 09b9 0400 0000 0017 6ab0 0000 09bf 0400 0000 0017 6ac0 0000 09cb 0400 0000
4502140  0017 6ad8 0000 09d1 0400 0000 0017 6ae8 0000 09dc 0400 0000 0017 6b00 0000 09e2 0400 0000 0017 6b10 0000 09ed 0400 0000
4502220  0017 6b28 0000 09f3 0400 0000 0017 6b38 0000 0a00 0400 0000 0017 6b50 0000 0a06 0400 0000 0017 6b60 0000 0a0f 0400 0000
4502300  0017 6b78 0000 0a15 0400 0000 0017 6b88 0000 0a22 0400 0000 0017 6c28 0000 0a2a 0400 0000 0017 6c88 0000 0a32 0400 0000
4502360  0017 6ca8 0000 0a41 0400 0000 0017 6db0 0000 0a4d 0400 0000 0017 6f68 0000 0a57 0500 078c 0017 70f8 0000 0a5e 0700 06e1
4502440  0017 73e8 0000 0a65 0900 05cc 0017 7928 0000 0a6a 0500 050e 0000 2020 0000 0a70 0500 037e 0001 6840 0000 0a76 0700 0572
4502520  0007 4430 0000 0a7f 0700 0641 0007 4488 0000 0a88 0700 063f 0007 4490 0000 0a91 0500 0642 0000 fcfc 0000 0a9a 0700 063e
4502600  0007 448c 0000 0aa3 0500 0797 0001 f094 0000 0abf 0500 052e 0002 4388 0000 0ac9 0900 040d 000a 55d0 0000 0ace 0500 027d
4502660  0001 efec 0000 0ae3 0700 0640 0007 4494 0000 0aec 0900 040e 000a 55d4 0000 0af1 0900 040f 000a 55d8 0000 0af6 0500 0650
```

| | | | | | | | | | | | | | | | | | | | | | | | | |
|---|---|---|---|---|---|---|---|---|---|---|---|---|---|---|---|---|---|---|---|---|---|---|---|---|
| 4502740 | 0000 | ccb8 | 0000 | 0aff | 0500 | 01d6 | 0001 | 6718 | 0000 | 0b0b | 0500 | 0647 | 0000 | cbb0 | 0000 | 0b14 | 0700 | 0483 | 0007 | 9008 | 0000 | 0b1e | 0700 | 03a3 |
| 4503020 | 000a | 45f8 | 0000 | 0b28 | 0500 | 040a | 0001 | 2584 | 0000 | 0b32 | 0500 | 064b | 0000 | c9c8 | 0000 | 0b3b | 0900 | 0410 | 000a | 5618 | 0000 | 0b40 | 0500 | 0648 |
| 4503100 | 0000 | cd40 | 0000 | 0b49 | 0500 | 064a | 0000 | cab0 | 0000 | 0b52 | 0500 | 0651 | 0000 | c8e8 | 0000 | 0b5b | 0900 | 007e | 000a | 562c | 0000 | 0b66 | 0900 | 0411 |
| 4503160 | 000a | 5630 | 0000 | 0b6b | 0700 | 0644 | 0007 | 7120 | 0000 | 0b74 | 0900 | 0412 | 000a | 5644 | 0000 | 0b79 | 0900 | 0413 | 000a | 5648 | 0000 | 0b7e | 0500 | 0652 |
| 4503240 | 0000 | db88 | 0000 | 0b87 | 0900 | 0414 | 000a | 5650 | 0000 | 0b8c | 0500 | 0646 | 0000 | daf0 | 0000 | 0b95 | 0500 | 0645 | 0002 | 0ec4 | 0000 | 0b9e | 0700 | 0589 |
| 4503320 | 000a | 1928 | 0000 | 0ba8 | 0500 | 06ab | 0001 | 6a1c | 0000 | 0bb0 | 0500 | 064d | 0001 | c548 | 0000 | 0bb9 | 0700 | 032e | 000a | 5348 | 0000 | 0bbf | 0900 | 0415 |
| 4503400 | 000a | 5a54 | 0000 | 0bc4 | 0900 | 0416 | 000a | 5a58 | 0000 | 0bc9 | 0900 | 0417 | 000a | 5be8 | 0000 | 0bce | 0900 | 0418 | 000a | 5bf0 | 0000 | 0bd3 | 0700 | 01b3 |
| 4503460 | 0007 | 5e48 | 0000 | 0be0 | 0700 | 06b9 | 0007 | 5f48 | 0000 | 0bea | 0500 | 0649 | 0000 | ef84 | 0000 | 0bf3 | 0500 | 064c | 0000 | efd4 | 0000 | 0bfc | 0500 | 064f |
| 4503540 | 0000 | f084 | 0000 | 0c05 | 0500 | 064e | 0000 | f0a0 | 0000 | 0c0e | 0500 | 0657 | 0000 | f068 | 0000 | 0c17 | 0500 | 0655 | 0000 | f270 | 0000 | 0c20 | 0500 | 0656 |
| 4503620 | 0000 | f178 | 0000 | 0c29 | 0900 | 0419 | 000a | 5c38 | 0000 | 0c2e | 0900 | 041a | 000a | 5c3c | 0000 | 0c33 | 0900 | 0643 | 000a | 5c40 | 0000 | 0c3c | 0900 | 041b |
| 4503700 | 000a | 5c74 | 0000 | 0c41 | 0700 | 0798 | 000a | 55c8 | 0000 | 0c48 | 0700 | 05c2 | 000a | 4a38 | 0000 | 0c55 | 0700 | 029a | 000a | 4ba0 | 0000 | 0c5f | 0500 | 0653 |
| 4503760 | 0000 | f590 | 0000 | 0c68 | 0500 | 07d7 | 0000 | f830 | 0000 | 0c70 | 0500 | 07b8 | 0000 | f99c | 0000 | 0c78 | 0900 | 041c | 000a | 5c78 | 0000 | 0c7d | 0900 | 041d |
| 4504040 | 000a | 5c80 | 0000 | 0c82 | 0500 | 065b | 0000 | fce4 | 0000 | 0c8d | 0500 | 0883 | 0002 | 36e8 | 0000 | 0c9a | 0500 | 0433 | 0001 | 4e34 | 0000 | 0ca3 | 0500 | 0658 |
| 4504120 | 0001 | 033c | 0000 | 0cac | 0500 | 065e | 0001 | 0300 | 0000 | 0cb5 | 0900 | 041e | 000a | 5e00 | 0000 | 0cba | 0900 | 041f | 000a | 5e04 | 0000 | 0cbf | 0900 | 0420 |
| 4504200 | 000a | 5e08 | 0000 | 0cc4 | 0900 | 0421 | 000a | 5e0c | 0000 | 0cc9 | 0900 | 0422 | 000a | 5e10 | 0000 | 0cce | 0500 | 077b | 0001 | 71f0 | 0000 | 0cd5 | 0900 | 0423 |
| 4504260 | 000a | 5e14 | 0000 | 0cda | 0900 | 0424 | 000a | 5e18 | 0000 | 0cdf | 0500 | 0661 | 0001 | 2144 | 0000 | 0ce8 | 0900 | 0425 | 000a | 5e1c | 0000 | 0ced | 0900 | 0426 |
| 4504340 | 000a | 5e20 | 0000 | 0cf2 | 0900 | 087c | 000a | 5e24 | 0000 | 0cf8 | 0500 | 0660 | 0001 | 21c0 | 0000 | 0d01 | 0900 | 087e | 000a | 5e28 | 0000 | 0d07 | 0900 | 0880 |
| 4504420 | 000a | 5e2c | 0000 | 0d0d | 0900 | 0882 | 000a | 5e30 | 0000 | 0d13 | 0900 | 0884 | 000a | 5e34 | 0000 | 0d19 | 0900 | 0886 | 000a | 5e38 | 0000 | 0d1f | 0900 | 0888 |
| 4504500 | 000a | 5e3c | 0000 | 0d25 | 0900 | 088a | 000a | 5e40 | 0000 | 0d2b | 0900 | 088c | 000a | 5e44 | 0000 | 0d31 | 0900 | 088e | 000a | 5e48 | 0000 | 0d37 | 0900 | 0890 |
| 4504560 | 000a | 5e4c | 0000 | 0d3d | 0900 | 0892 | 000a | 5e50 | 0000 | 0d43 | 0900 | 0894 | 000a | 5e54 | 0000 | 0d49 | 0900 | 0896 | 000a | 5e58 | 0000 | 0d4f | 0900 | 0898 |
| 4504640 | 000a | 5e5c | 0000 | 0d55 | 0900 | 089a | 000a | 5e60 | 0000 | 0d5b | 0500 | 0662 | 0001 | 2f28 | 0000 | 0d64 | 0500 | 065c | 0001 | 2d78 | 0000 | 0d6d | 0500 | 0379 |
| 4504720 | 0001 | 6d78 | 0000 | 0d73 | 0500 | 0659 | 0001 | 2df8 | 0000 | 0d7c | 0900 | 089c | 000a | 5e68 | 0000 | 0d82 | 0500 | 065f | 0001 | 2b60 | 0000 | 0d8b | 0900 | 0000 |
| 4505000 | 000a | 5e80 | 0000 | 0d91 | 0500 | 066b | 0001 | 2bd0 | 0000 | 0d9a | 0500 | 0668 | 0001 | 2984 | 0000 | 0da3 | 0500 | 0654 | 0001 | 29f4 | 0000 | 0dac | 0500 | 0678 |
| 4505060 | 0001 | 45e0 | 0000 | 0db5 | 0500 | 0665 | 0001 | 2f08 | 0000 | 0dbe | 0900 | 0002 | 000a | 5ed8 | 0000 | 0dc4 | 0500 | 065a | 0001 | 26e0 | 0000 | 0dcd | 0500 | 0669 |
| 4505140 | 0001 | 2d40 | 0000 | 0dd6 | 0500 | 066a | 0001 | 2bf0 | 0000 | 0ddf | 0500 | 0667 | 0001 | 2af0 | 0000 | 0de8 | 0500 | 066e | 0001 | 2a80 | 0000 | 0df1 | 0500 | 042b |
| 4505220 | 0001 | 4920 | 0000 | 0e01 | 0500 | 065d | 0001 | 4ff4 | 0000 | 0e0a | 0500 | 0676 | 0001 | 4f4c | 0000 | 0e13 | 0500 | 0663 | 0001 | 2968 | 0000 | 0e1c | 0500 | 01e5 |
| 4505300 | 0001 | 4774 | 0000 | 0e25 | 0500 | 0427 | 0001 | 4d60 | 0000 | 0e2e | 0500 | 039b | 0001 | 4ba8 | 0000 | 0e37 | 0900 | 0004 | 000a | 62e8 | 0000 | 0e3d | 0500 | 0664 |
| 4505360 | 0001 | c9fc | 0000 | 0e46 | 0500 | 066d | 0001 | 39e0 | 0000 | 0e4f | 0500 | 066c | 0001 | 300c | 0000 | 0e58 | 0500 | 0666 | 0001 | 46ac | 0000 | 0e61 | 0500 | 0675 |
| 4505440 | 0001 | 4720 | 0000 | 0e6a | 0500 | 0671 | 0001 | 301c | 0000 | 0e73 | 0500 | 0682 | 0001 | 2d5c | 0000 | 0e7c | 0500 | 0683 | 0001 | 2ca0 | 0000 | 0e85 | 0500 | 0677 |
| 4505520 | 0001 | 2f48 | 0000 | 0e8e | 0500 | 0685 | 0001 | c9e8 | 0000 | 0e97 | 0500 | 067b | 0001 | 2e10 | 0000 | 0ea0 | 0500 | 0039 | 0001 | 4d7c | 0000 | 0eaa | 0500 | 084f |
| 4505600 | 0001 | 4bc0 | 0000 | 0eb4 | 0900 | 07e8 | 000a | 62ec | 0000 | 0ebe | 0900 | 000a | 000a | 62f0 | 0000 | 0ec8 | 0500 | 0049 | 0001 | 4e74 | 0000 | 0ed2 | 0500 | 066f |
| 4505660 | 0001 | 2610 | 0000 | 0edb | 0900 | 0006 | 000a | 62f8 | 0000 | 0ee1 | 0500 | 067a | 0001 | 2fe0 | 0000 | 0eea | 0500 | 0687 | 0001 | 3000 | 0000 | 0ef3 | 0900 | 0008 |
| 4505740 | 000a | 6700 | 0000 | 0ef9 | 0900 | 000b | 000a | 68e0 | 0000 | 0eff | 0500 | 0672 | 0001 | 35bc | 0000 | 0f08 | 0500 | 0042 | 0001 | 66e4 | 0000 | 0f13 | 0900 | 07cc |
| 4506020 | 000a | 68e4 | 0000 | 0f1e | 0900 | 00ae | 000a | 68e8 | 0000 | 0f29 | 0500 | 0674 | 0001 | 464c | 0000 | 0f32 | 0500 | 068a | 0001 | 3980 | 0000 | 0f3b | 0500 | 0670 |
| 4506100 | 0001 | 2678 | 0000 | 0f44 | 0500 | 067d | 0001 | 2eac | 0000 | 0f4d | 0500 | 0679 | 0001 | 50f4 | 0000 | 0f56 | 0500 | 0698 | 0001 | 314c | 0000 | 0f5f | 0500 | 0637 |
| 4506160 | 0001 | 6ee4 | 0000 | 0f68 | 0500 | 06fb | 0001 | 7304 | 0000 | 0f6f | 0500 | 027e | 0001 | 6b70 | 0000 | 0f79 | 0500 | 056b | 0001 | 7288 | 0000 | 0f81 | 0500 | 07cb |
| 4506240 | 0001 | 6a7c | 0000 | 0f89 | 0900 | 000c | 000a | 68f0 | 0000 | 0f8f | 0900 | 000e | 000a | 6900 | 0000 | 0f95 | 0900 | 0010 | 000a | 6910 | 0000 | 0f9b | 0500 | 0689 |
| 4506320 | 0001 | 91b8 | 0000 | 0fa4 | 0500 | 069a | 0001 | 911c | 0000 | 0fad | 0900 | 087d | 000a | 6920 | 0000 | 0fb3 | 0900 | 087f | 000a | 6928 | 0000 | 0fb9 | 0500 | 067c |
| 4506400 | 0001 | 9268 | 0000 | 0fc2 | 0500 | 068b | 0001 | 906c | 0000 | 0fcb | 0900 | 0881 | 000a | 6939 | 0000 | 0fd1 | 0900 | 0887 | 000a | 6948 | 0000 | 0fd7 | 0900 | 0885 |
| 4506460 | 000a | 6970 | 0000 | 0fdd | 0900 | 088b | 000a | 6980 | 0000 | 0fe3 | 0500 | 06ad | 0002 | 08a8 | 0000 | 0fec | 0900 | 0889 | 000a | 69b4 | 0000 | 0ff2 | 0500 | 069b |
| 4506540 | 0001 | a5c8 | 0000 | 0ffb | 0900 | 088f | 000a | 69b8 | 0000 | 1001 | 0900 | 088d | 000a | 69bc | 0000 | 1007 | 0500 | 0688 | 0001 | a61c | 0000 | 1010 | 0500 | 0684 |
| 4506620 | 0001 | a5fc | 0000 | 1019 | 0500 | 0694 | 0001 | ba40 | 0000 | 1022 | 0500 | 0686 | 0002 | 2908 | 0000 | 102b | 0500 | 05cf | 0001 | bb14 | 0000 | 1030 | 0500 | 044e |
| 4506700 | 0006 | de2c | 0000 | 103a | 0900 | 0893 | 000a | 69c0 | 0000 | 1040 | 0900 | 0891 | 000a | 69c4 | 0000 | 1046 | 0500 | 03c1 | 0001 | bb3c | 0000 | 104c | 0500 | 0699 |
| 4506760 | 0001 | c4fc | 0000 | 1055 | 0500 | 068c | 0001 | c41c | 0000 | 105e | 0500 | 01cc | 0001 | c528 | 0000 | 1066 | 0900 | 0897 | 000a | 69c8 | 0000 | 106c | 0500 | 0696 |
| 4507040 | 0001 | ca98 | 0000 | 1075 | 0500 | 06ac | 0001 | cb70 | 0000 | 107e | 0500 | 06c1 | 0001 | cdd0 | 0000 | 1087 | 0500 | 06c2 | 0001 | caf8 | 0000 | 1090 | 0500 | 06c0 |
| 4507120 | 0001 | cbd8 | 0000 | 1099 | 0500 | 0697 | 0001 | ca7c | 0000 | 10a2 | 0500 | 06aa | 0001 | cb88 | 0000 | 10ab | 0500 | 06a5 | 0001 | cc08 | 0000 | 10b4 | 0500 | 06bf |
| 4507200 | 0001 | c9b8 | 0000 | 10bd | 0500 | 0673 | 0001 | c7b8 | 0000 | 10c6 | 0500 | 069d | 0001 | ca4c | 0000 | 10cf | 0500 | 067e | 0001 | c9d0 | 0000 | 10d8 | 0700 | 02c7 |
| 4507260 | 000a | 4930 | 0000 | 10e1 | 0500 | 06d7 | 0001 | cdc4 | 0000 | 10ea | 0900 | 06a7 | 000a | 69f0 | 0000 | 10f3 | 0500 | 067f | 0001 | cdf8 | 0000 | 10fc | 0500 | 0695 |
| 4507340 | 0001 | ce30 | 0000 | 1105 | 0500 | 06d9 | 0001 | d0c4 | 0000 | 110e | 0500 | 0681 | 0001 | d1e8 | 0000 | 1117 | 0500 | 0693 | 0001 | d334 | 0000 | 1120 | 0500 | 0690 |
| 4507420 | 0001 | d3d4 | 0000 | 1129 | 0500 | 068d | 0001 | d0f0 | 0000 | 1132 | 0500 | 06a9 | 0001 | d9f4 | 0000 | 113b | 0500 | 06d6 | 0001 | d8b0 | 0000 | 1144 | 0500 | 06a8 |
| 4507500 | 0001 | d844 | 0000 | 114d | 0500 | 069c | 0001 | d560 | 0000 | 1156 | 0500 | 06bc | 0001 | ef88 | 0000 | 115f | 0500 | 06af | 0001 | fad8 | 0000 | 1168 | 0500 | 0690 |
| 4507560 | 0001 | fa58 | 0000 | 1171 | 0500 | 06bd | 0001 | fa2c | 0000 | 117a | 0500 | 053f | 0001 | f018 | 0000 | 1196 | 0500 | 06d8 | 0001 | f580 | 0000 | 119f | 0500 | 06c9 |
| 4507640 | 0001 | efd8 | 0000 | 11b4 | 0500 | 068e | 0001 | fb98 | 0000 | 11bd | 0500 | 06ae | 0001 | fb34 | 0000 | 11c6 | 0500 | 068f | 0001 | faec | 0000 | 11cf | 0500 | 069e |
| 4507720 | 0002 | 0b8c | 0000 | 11d8 | 0500 | 06ef | 0002 | 0a60 | 0000 | 11e1 | 0500 | 06f0 | 0002 | 0ea0 | 0000 | 11ea | 0500 | 06b1 | 0002 | 0c68 | 0000 | 11f3 | 0500 | 06b0 |
| 4510000 | 0002 | 14ec | 0000 | 11fc | 0500 | 06f1 | 0002 | 1494 | 0000 | 1205 | 0500 | 070c | 0002 | 0c7c | 0000 | 120e | 0500 | 06c3 | 0002 | 0c94 | 0000 | 1217 | 0500 | 06f2 |

```
4510060  0002 0ca8 0000 1220 0500 070a 0002 0e5c 0000 1229 0500 06bb 0002 0cbc 0000 1232 0500 0864 0002 3620 0000 123f 0500 083b
4510140  0002 35d8 0000 124a 0900 0895 000a 6bf8 0000 1250 0500 03bd 0002 35a0 0000 125a 0900 089b 000a 6c04 0000 1260 0500 06be
4510220  0002 2630 0000 1269 0500 06a6 0002 2694 0000 1272 0500 06c4 0002 25d8 0000 127b 0500 0692 0002 2790 0000 1284 0500 0727
4510300  0002 29b4 0000 128d 0500 06c6 0002 2974 0000 1296 0500 06a3 0002 334c 0000 129f 0900 0899 000a 6c08 0000 12a5 0500 06a0
4510360  0002 29cc 0000 12ae 0900 0001 000a 6c0c 0000 12b4 0900 077f 000a 6c10 0000 12be 0500 00db 0006 f2f4 0000 12c6 0500 00c1
4510440  0006 f3d8 0000 12ce 0500 00d5 0006 f428 0000 12d6 0500 0138 0006 f4d0 0000 12de 0500 0142 0006 f2d8 0000 12e6 0500 0775
4510520  0006 f250 0000 12fe 0500 078b 0006 f29c 0000 1314 0500 03f7 0006 f1f4 0000 1322 0500 0329 0006 ed98 0000 1333 0500 0518
4510600  0006 dc30 0000 1348 0500 0486 0006 e204 0000 135a 0500 06dd 0006 f070 0000 136b 0500 00bd 0006 f154 0000 137e 0500 0005
4510660  0006 e1c8 0000 139f 0500 076c 0006 e384 0000 139d 0500 0774 0006 e424 0000 13ab 0500 0753 0006 f21c 0000 13c1 0500 052d
4510740  0006 f1d0 0000 13cf 0500 0762 0006 e4a8 0000 13e5 0500 04cd 0006 ebec 0000 1401 0900 076a 000a 6c90 0000 1411 0700 06f4
4511020  000a 45f8 0000 1418 0500 079c 0006 ed28 0000 1427 0500 057a 0006 e0ec 0000 143c 0900 02d3 000a 6ca0 0000 1440 0500 046f
4511100  0006 ec68 0000 144f 0900 0368 000a 6ca8 0000 145e 0700 07b1 000a 45fc 0000 1471 0900 02da 000a 6cb8 0000 1475 0500 050a
4511160  0006 e284 0000 1484 0500 061f 0006 eb5c 0000 149c 0500 0791 000b d858 0000 14a8 0500 051c 000b da84 0000 14bf 0500 012e
4511240  000b d800 0000 14d0 0500 0691 000b d88c 0000 14e2 0500 05c3 000b d844 0000 14f4 0500 06e5 000b d874 0000 150a 0500 0214
4511320  000b da10 0000 1523 0500 0029 000b d864 0000 152f 0700 0478 000b db28 0000 1536 0700 0479 000d 15e0 0000 153d 0500 028b
4511400  000d 1400 0000 1551 0500 05cb 000d 1410 0000 155a 0500 03f0 000d 1598 0000 1560 0500 02bb 000d 1570 0000 156b 0500 024b
4511460  000d 1538 0000 1574 0500 0488 000d 15d0 0000 157d 0500 081c 000d 15c0 0000 1584 0500 06b5 000d 1c2c 0000 158d 0500 0857
4511540  000d 1c00 0000 1596 0500 05e9 000d 1c54 0000 159f 0500 04ba 000d 1cdc 0000 15a9 0700 047a 000d 1e50 0000 15b0 0500 073b
4511620  000d 1d88 0000 15b7 0500 072e 000d 1db0 0000 15be 0500 03c2 000d 1dd8 0000 15c4 0500 076d 000d 1e00 0000 15cc 0500 0875
4511700  000d 1e28 0000 15d4 0700 047b 000e 7100 0000 15db 0500 04dc 000e 7018 0000 15e4 0500 04dd 000e 7098 0000 15ed 0500 0514
4511760  000e 7000 0000 15f6 0900 05de 000e 7128 0000 15fb 0500 060d 000e 98a4 0000 1600 0500 033d 000e 95b0 0000 1606 0500 0134
4512040  000e 94b4 0000 160e 0500 0108 000e 9450 0000 1616 0500 0176 000e 8f90 0000 161e 0500 01a8 000e 8da0 0000 1626 0500 0186
4512120  000e 8e98 0000 162e 0500 01b6 000e 9318 0000 1636 0500 0150 000e 8dd8 0000 163e 0500 0190 000e 9214 0000 1646 0500 0216
4512200  000e ff68 0000 1650 0500 0604 000e e568 0000 1655 0500 05f8 000e e578 0000 165a 0500 06e6 000e cbc4 0000 1661 0500 071c
4512260  000e 8c00 0000 1668 0500 06da 000e 8b00 0000 166f 0500 0734 000e 88dc 0000 1676 0500 070b 000e c340 0000 167d 0500 07fe
4512340  000f 03c0 0000 1684 0500 03d2 000e d940 0000 168a 0500 0406 000f 0898 0000 1690 0500 03ba 000e c928 0000 1696 0500 070e
4512420  000e c360 0000 169d 0500 0778 000e 96e8 0000 16a4 0500 0280 000e aa28 0000 16a8 0500 0281 000e b074 0000 16ac 0500 02be
4512500  000e b7a8 0000 16b0 0500 05d5 000e e570 0000 16b5 0500 05ec 000e e2a8 0000 16ba 0700 047c 000f 2520 0000 16c1 0500 07d8
4512560  000e 8800 0000 16c9 0500 035a 000e d0d8 0000 16cf 0500 0366 000e a800 0000 16d5 0500 0337 000e a668 0000 16db 0500 05cd
4512640  000e d498 0000 16e0 0500 029e 000e ac54 0000 16e4 0500 029f 000e b354 0000 16e8 0500 0374 000e d710 0000 16ee 0500 02dc
4512720  000e bafc 0000 16f2 0500 03a4 000e 97b8 0000 16f8 0500 0293 000e 96a8 0000 1702 0500 0788 000e 95d0 0000 1709 0500 0770
4513000  000f 1e2c 0000 1710 0500 01aa 000e c528 0000 171b 0500 033c 000f 1e84 0000 1721 0500 0780 000f 009c 0000 1728 0500 0724
4513060  000f 022c 0000 1730 0500 0011 000e 96bc 0000 173b 0500 00dc 000e 966c 0000 174a 0500 07a0 000e 9658 0000 1759 0500 06a4
4513140  000e 96d0 0000 1768 0500 047d 000e 9694 0000 1774 0500 077c 000e 9680 0000 1780 0500 034e 000f 1dcc 0000 1786 0500 0578
4513220  000f 0bc8 0000 1795 0500 03b6 000f 1ee4 0000 179b 0500 03d6 000f 1d30 0000 17a1 0500 047e 000f 22c8 0000 17a6 0500 0718
4513300  000f 1f50 0000 17ad 0700 0741 000f 31d0 0000 17b6 0500 06a1 000e bd80 0000 17be 0900 00a2 000f 4b70 0000 17cc 0500 0378
4513360  000e c6c8 0000 17d2 0500 0371 000e c6bc 0000 17d8 0500 0783 000e db40 0000 17df 0700 0749 000f 4180 0000 17e6 0500 07e7
4513440  000e e580 0000 17ee 0500 03ca 000e eeb0 0000 17f8 0500 0080 000e f1b0 0000 1807 0500 0448 000f 2018 0000 190c 0500 06cd
4513520  000f 0048 0000 1819 0500 0744 000f 03b4 0000 1822 0500 0530 000f 0020 0000 182c 0500 07b2 000e ffec 0000 1833 0500 07b4
4513600  000e ffb8 0000 183a 0500 06d4 000e ff94 0000 1842 0500 024a 000f 0120 0000 184d 0500 07b5 000f 0078 0000 1855 0500 0580
4513660  000f 1d28 0000 185e 0500 0007 000f 24f8 0000 1865 0900 042d 000f 4b74 0000 187c 0500 07b9 000f 1da0 0000 1883 0500 00c2
4513740  000f 2010 0000 1889 0500 025d 0014 9980 0000 1891 0500 02ed 0014 9384 0000 1899 0500 0282 0014 9bc0 0000 18a1 0500 0312
4514020  0014 98a4 0000 18a9 0500 0326 0014 93fc 0000 18b1 0500 0284 0014 9958 0000 18b9 0500 0310 0014 9368 0000 18c1 0500 039c
4514100  0014 90f0 0000 18c9 0500 074e 0014 9050 0000 18d2 0500 008d 0014 9d8c 0000 18db 0500 007d 0014 9c64 0000 18e4 0500 06c8
4514160  0014 907c 0000 18ed 0500 0185 0014 a4a0 0000 18f6 0500 010e 0014 9000 0000 18ff 0500 0852 0014 9f2c 0000 1908 0500 00ec
4514240  0014 9e4c 0000 1911 0500 076b 0014 9198 0000 191a 0500 00dd 0014 9ce4 0000 1923 0500 00f4 0014 9018 0000 192c 0700 0481
4514320  0015 24f8 0000 1933 0500 0569 0014 9c28 0000 193a 0500 05b1 0014 9910 0000 1941 0500 057b 0014 99e4 0000 1948 0500 063c
4514400  0014 a044 0000 194f 0500 0598 0014 951c 0000 1956 0500 05a8 0014 949c 0000 195d 0500 0470 0014 a4d0 0000 1962 0500 0046
4514460  0014 fbf8 0000 196b 0500 036e 0014 a780 0000 1971 0500 0375 0014 a7a0 0000 1977 0500 009b 0014 a9f0 0000 197f 0500 0367
4514540  0014 a870 0000 1985 0500 00e9 0014 a4c8 0000 198b 0500 004e 0014 a928 0000 1993 0500 036f 0014 a8cc 0000 1999 0500 0808
4514620  0014 bba8 0000 19a3 0500 0003 0014 bcdc 0000 19ad 0500 009c 0014 ce3c 0000 19c0 0500 0618 0014 ab00 0000 19d3 0500 06e2
4514700  0014 fd20 0000 19da 0500 077a 0014 fc48 0000 19e1 0500 03d4 0014 fc80 0000 19e7 0500 083f 0014 fcf0 0000 19ee 0500 0496
4514760  0014 e72c 0000 1a01 0500 07a1 0014 ff90 0000 1a0f 0500 04b1 0014 ed88 0000 1a1d 0500 060e 0014 eac0 0000 1a2b 0500 0407
4515040  0014 c348 0000 1a47 0500 06b6 0014 d0ac 0000 1a5c 0500 025c 0014 c850 0000 1a71 0500 03d3 0014 f3dc 0000 1a80 0500 00f5
4515120  0014 fd28 0000 1a86 0500 06b4 0014 ffbc 0000 1a92 0500 074c 0015 0090 0000 1a9e 0900 0390 0015 2a30 0000 1ab5 0900 077d
```

```
4515200  0015 2a34 0000 1acc 0500 01f7 0014 cbec 0000 1adf 0500 0592 0014 f088 0000 1aef 0500 0763 0014 be30 0000 1b0a 0900 00a1
4515260  0015 2a38 0000 1b22 0500 06cb 0014 d894 0000 1b3e 0500 0639 0014 f504 0000 1b4c 0500 07f8 0014 d2f0 0000 1b5b 0500 0574
4515340  0014 dca0 0000 1b70 0500 05c4 0014 f674 0000 1b80 0500 05e0 0014 f2b8 0000 1b90 0500 001b 0014 d4e8 0000 1bab 0500 0792
4515420  0014 ff4d 0000 1bb8 0500 024e 0014 e9ac 0000 1bc7 0500 029c 0014 f4e8 0000 1bda 0500 071f 0014 f9a4 0000 1bea 0500 0438
4515500  0014 f5c4 0000 1bf9 0500 0795 0014 f7e8 0000 1c07 0500 013c 0014 faf4 0000 1c19 0500 0314 0014 f838 0000 1c29 0500 046e
4515560  0014 f928 0000 1c3a 0500 027f 0015 0178 0000 1c43 0500 06cf 0014 fca0 0000 1c4b 0500 07dc 0014 fcc8 0000 1c52 0500 006a
4515640  0015 2114 0000 1c5c 0500 04de 0015 19e0 0000 1c65 0500 06d0 0015 1d40 0000 1c6d 0500 0024 0015 1c10 0000 1c75 0500 003e
4515720  0015 1938 0000 1c7f 0500 07a2 0015 1be8 0000 1c86 0700 05fa 0015 2a28 0000 1c8e 0500 056a 0015 23d8 0000 1c96 0500 0601
4516000  0015 15f8 0000 1c9e 0500 06c5 0015 1694 0000 1ca6 0500 0733 0015 1d00 0000 1cae 0500 0266 0015 1718 0000 1cb7 0500 0527
4516060  0015 1ba8 0000 1cc1 0500 0464 0015 1ab8 0000 1ccb 0500 0396 0015 15e0 0000 1cd5 0500 078d 0015 24d0 0000 1cdc 0500 0376
4516140  0015 2168 0000 1ce2 0500 06b8 0015 1d70 0000 1ce9 0500 02a3 0015 2290 0000 1cf7 0500 074b 0015 24a8 0000 1d06 0500 0457
4516220  0015 234c 0000 1d12 0500 047f 0015 2198 0000 1d1c 0500 00fb 0015 8800 0000 1d24 0500 019a 0015 89d8 0000 1d2c 0500 0197
4516300  0015 91f4 0000 1d34 0500 0832 0015 8d60 0000 1d3c 0700 0482 0015 a218 0000 1d43 0500 0173 0015 89b0 0000 1d4b 0500 03d5
4516360  0015 9d98 0000 1d51 0500 073f 0015 9964 0000 1d5c 0500 06de 0015 9a94 0000 1d64 0500 0619 0015 9abc 0000 1d6d 0500 039d
4516440  0015 9e28 0000 1d73 0500 04ff 0015 9dd8 0000 1d7b 0500 0709 0015 a170 0000 1d83 0500 0020 0015 98d0 0000 1d8a 0500 0013
4516520  0015 9930 0000 1d95 0500 089d 0015 9d60 0000 1d9d 0500 0021 0015 9e50 0000 1da5 0500 0451 0015 9e00 0000 1db3 0500 0127
4516600  0016 c000 0000 1dbb 0500 013d 0016 c630 0000 1dc3 0500 01a0 0016 c6a0 0000 1dcb 0500 0198 0016 c4a4 0000 1dd3 0500 0166
4516660  0016 c3a4 0000 1ddb 0500 0172 0016 c254 0000 1de3 0500 0151 0016 c02c 0000 1deb 0700 0480 0017 70f8 0000 1df2 0500 005a
4516740  0016 cb28 0000 1dfc 0500 0713 0016 fe30 0000 1e05 0500 01d0 0016 db74 0000 1e0f 0500 00e0 0016 cb9c 0000 1e19 0500 05da
4517020  0016 ff20 0000 1e22 0500 075e 0016 edb8 0000 1e29 0500 0012 0016 c868 0000 1e31 0500 001c 0017 2978 0000 1e3d 0500 0032
4517100  0016 cd90 0000 1e47 0500 00f6 0016 cc4c 0000 1e51 0500 00f2 0016 ceac 0000 1e5b 0500 00cd 0017 0060 0000 1e64 0500 06f5
4517160  0017 4248 0000 1e6b 0500 0784 0017 1738 0000 1e72 0500 072b 0017 1238 0000 1e79 0500 00b0 0017 2f88 0000 1e82 0500 005e
4517240  0016 cdf0 0000 1e8d 0500 06f3 0016 cd00 0000 1e97 0500 0167 0017 36d4 0000 1ea1 0500 015a 0017 2ab8 0000 1eab 0500 05ea
4517320  0016 cb60 0000 1eb6 0500 07d6 0017 1590 0000 1ebe 0500 0056 0017 00a8 0000 1ec6 0900 0289 0017 73e8 0000 1ed4 0500 00ea
4517400  0016 dcdc 0000 1ede 0500 01a4 0016 da9c 0000 1ee8 0500 01ab 0016 ddec 0000 1ef2 0500 0860 0017 02f8 0000 1eff 0500 07aa
4517460  0016 dc4c 0000 1f09 0500 06ff 0016 dd44 0000 1f14 0500 05ce 0017 0868 0000 1f1d 0500 0614 0017 03a0 0000 1f2a 0500 0377
4517540  0017 0450 0000 1f37 0500 03a0 0017 1ab8 0000 1f33 0500 01a1 0016 fba0 0000 1f48 0500 00e7 0017 19c8 0000 1f53 0500 0320
4517620  0016 fbc0 0000 1f5e 0500 07c5 0017 1ae8 0000 1f65 0500 0802 0017 1a68 0000 1f6c 0500 0831 0017 1a90 0000 1f73 0500 06b3
4517700  0016 faf8 0000 1f7e 0500 0779 0016 f720 0000 1f86 0500 01d7 0017 1a18 0000 1f93 0500 06e9 0017 1a40 0000 1f9b 0500 00be
4517760  0017 0000 0000 1fa4 0500 013e 0016 fc20 0000 1faf 0500 0765 0017 1378 0000 1fb6 0500 0751 0017 19a0 0000 1fbd 0500 020c
4520040  0016 fd48 0000 1fc8 0500 034f 0016 f810 0000 1fce 0500 05a4 0017 18d0 0000 1fd7 0500 0089 0017 19f0 0000 1fe1 0500 00cf
4520120  0017 4490 0000 1fea 0500 0776 0017 4428 0000 1ff1 0500 073c 0017 0800 0000 1ffb 0500 0563 0017 4460 0000 2004 0500 01fe
4520200  0017 15e8 0000 200d 0500 0536 0017 175c 0000 2016 0500 0273 0017 3c80 0000 2030 0500 02cb 0017 2a50 0000 203e 0500 006f
4520260  0017 5fb8 0000 204a 0500 0540 0017 1fbc 0000 2061 0500 0728 0017 69d0 0000 2068 0500 003c 0017 1dd4 0000 2071 0500 035c
4520340  0017 1b10 0000 207d 0500 0298 0017 3e48 0000 208e 0500 07d9 0017 69f8 0000 209d 0500 06e3 0017 4eb8 0000 20b0 0500 0026
4520420  0017 5f10 0000 20ba 0500 0865 0017 5a38 0000 20c4 0500 0803 0017 4d30 0000 20cb 0500 05e2 0017 6980 0000 20d0 0500 0474
4520500  0017 6958 0000 20d9 0500 0494 0017 1dec 0000 20e4 0500 061c 0017 2a6c 0000 20f5 0500 008a 0017 4578 0000 20fd 0500 07fc
4520560  0017 6b60 0000 2105 0500 0346 0017 6930 0000 210b 0500 0358 0017 69a8 0000 2111 0500 06ce 0017 6a20 0000 211e 0500 0106
4520640  0017 6b88 0000 212a 0500 032f 0017 2df0 0000 213a 0500 00c3 0017 3d90 0000 214e 0500 0059 0017 3d10 0000 215f 0500 0785
4520720  0017 3f40 0000 216f 0500 06ca 0017 3fb0 0000 2180 0500 0338 0017 4068 0000 2186 0500 019b 0017 3318 0000 2195 0500 01db
4521000  0017 3cb8 0000 21a4 0500 0526 0017 3d50 0000 21b4 0500 007b 0017 6278 0000 21c0 0500 01a7 0017 652c 0000 21cc 0500 051d
4521060  0017 3c9c 0000 21e3 0500 0224 0017 3e04 0000 21f3 0500 018d 0017 3ecc 0000 2204 0500 0835 0017 6260 0000 220e 0500 0405
4521140  0017 3eb0 0000 2227 0500 07cd 0017 3c60 0000 2232 0500 0853 0017 638c 0000 223d 0500 05f4 0017 3de8 0000 224c 0500 02b1
4521220  0017 4020 0000 2263 0500 0070 0017 64a0 0000 226e 0500 03eb 0017 4cd4 0000 227a 0500 02bc 0017 6b38 0000 2286 0500 007c
4521300  0017 4c98 0000 2290 0500 072c 0017 4ba4 0000 2299 0500 06ea 0017 6c28 0000 22a0 0500 0757 0017 6c88 0000 22a7 0500 0215
4521360  0017 45a4 0000 22b0 0500 05db 0017 6ae8 0000 22ba 0500 035e 0017 68f0 0000 22c4 0500 07ba 0017 6a98 0000 22cc 0500 06d5
4521440  0017 6b10 0000 22d6 0500 0616 0017 6ac0 0000 22e1 0500 00b1 0017 6ca8 0000 22ef 0500 02b5 0017 5e28 0000 22fe 0500 0579
4521520  0017 5cb8 0000 230b 0500 0511 0017 6a48 0000 2315 0500 0068 0017 58e0 0000 2323 0900 06f6 0017 73f0 0000 232f 0500 01a2
4521600  0017 5aa0 0000 2340 0500 03c9 0017 5c20 0000 234e 0500 05c9 0017 5168 0000 235e 0900 03a2 0017 7400 0000 236d 0500 01cd
4521660  0017 59a8 0000 237e 0500 0789 0017 6a70 0000 2386 0500 011f 0017 6db0 0000 2397 0500 037d 0017 66b8 0000 23a5 0500 01a4
4521740  0017 60b4 0000 23b3 0500 003b 0017 5b9c 0000 23c7 0500 0611 0017 5af8 0000 23db 0500 002b 0017 5adc 0000 23ea 0500 001a
4522020  0017 6480 0000 23f6 0500 0015 0017 617c 0000 2402 0500 06ee 0017 6648 0000 2412 0500 0842 0017 5f18 0000 241b 0500 0825
4522100  0017 5ee8 0000 2425 0500 085d 0017 5f48 0000 242f 0500 0814 0017 61b8 0000 2439 0500 07ea 0017 6140 0000 2443 0500 0044
4522160  0017 6028 0000 244e 0500 002d 0017 5f30 0000 2459 0500 0409 0017 6f68 0000 2462 5f5f 4459 4e41 4d49 4300 7170 7379 6d39
4522240  3132 3700 5f5f 4459 4e41 4d49 4300 7170 7379 6d39 3132 3700 5f5f 4459 4e41 4d49 4300 7170 7379 6d39 3132 3700 5f5f 4459
```

| | | | | | | | | | | | | | | | | | | | | | | | | |
|---|---|---|---|---|---|---|---|---|---|---|---|---|---|---|---|---|---|---|---|---|---|---|---|---|
| 4522320 | 4e41 | 4d49 | 4300 | 7170 | 7379 | 6d39 | 3132 | 3700 | 5f5f | 4459 | 4e41 | 4d49 | 4300 | 7170 | 7379 | 6d39 | 3132 | 3700 | 5f5f | 4459 | 4e41 | 4d49 | 4300 | 7170 |
| 4522400 | 7379 | 6d39 | 3132 | 3700 | 5f5f | 4459 | 4e41 | 4d49 | 4300 | 7170 | 7379 | 6d39 | 3132 | 3700 | 5f5f | 4459 | 4e41 | 4149 | 4300 | 7170 | 7379 | 6d39 | 3132 | 3700 |
| 4522460 | 5f5f | 4459 | 4e41 | 4d49 | 4300 | 6372 | 7430 | 2e6f | 0071 | 7072 | 656c | 2e6f | 0071 | 7061 | 3034 | 3733 | 382e | 6f00 | 696e | 7465 | 7266 | 6163 | 652e | 6f00 |
| 4522540 | 5f62 | 6174 | 6368 | 696e | 6700 | 5f63 | 7572 | 7265 | 6e74 | 5f73 | 656e | 645f | 6275 | 6666 | 6572 | 005f | 7265 | 706c | 6965 | 7300 | 5f69 | 6e70 | 7574 | 5f66 |
| 4522620 | 6400 | 5f72 | 6563 | 6569 | 7665 | 5f62 | 7566 | 6665 | 725f | 7074 | 7200 | 5f73 | 656e | 645f | 6275 | 6666 | 6572 | 5f6c | 656e | 6774 | 6800 | 5f6d | 6573 | 7361 |
| 4522700 | 6765 | 7300 | 5f72 | 6570 | 6c79 | 5f74 | 696d | 6573 | 7461 | 6d70 | 005f | 7365 | 6e64 | 5f62 | 7566 | 6665 | 725f | 7074 | 7200 | 5f66 | 6972 | 7374 | 5f73 | 656e |
| 4522760 | 645f | 6275 | 6666 | 6572 | 005f | 6f75 | 7470 | 7574 | 5f66 | 6400 | 5f6d | 6573 | 7361 | 6765 | 5f74 | 696d | 6573 | 7461 | 6d70 | 005f | 7365 | 6e64 | 5f62 | 7566 |
| 4523040 | 6665 | 725f | 636f | 756e | 7400 | 656e | 7669 | 726f | 6e2e | 6f00 | 5f53 | 4343 | 5369 | 6400 | 5f61 | 7267 | 6300 | 5f61 | 7267 | 7000 | 5f61 | 7267 | 7600 | 6374 |
| 4523120 | 7370 | 655f | 2e6f | 0065 | 7272 | 6c73 | 742e | 6f00 | 696f | 622e | 6f00 | 6572 | 726e | 6f2e | 6f00 | 7170 | 6c69 | 6e6b | 3931 | 3237 | 2e6f | 0063 | 6861 | 7273 |
| 4523200 | 696f | 2e6f | 005f | 5343 | 4353 | 6964 | 005f | 6273 | 5f6f | 636c | 6f73 | 6500 | 5f62 | 735f | 6963 | 6c6f | 7365 | 005f | 6273 | 5f65 | 6f66 | 005f | 6273 | 5f70 |
| 4523260 | 7574 | 005f | 6273 | 5f67 | 6574 | 0071 | 706c | 696e | 6b39 | 3132 | 372e | 6f00 | 6561 | 6363 | 6573 | 732e | 6f00 | 5f53 | 4343 | 5369 | 6400 | 5f6e | 6769 | 6473 |
| 4523340 | 005f | 6769 | 6400 | 5f65 | 7569 | 6400 | 5765 | 7467 | 726f | 7570 | 732e | 6f00 | 6e6f | 6572 | 7200 | 7374 | 6174 | 2e6f | 006e | 6f65 | 7272 | 0063 | 6572 | 726f |
| 4523420 | 722e | 6f00 | 6765 | 7465 | 7569 | 642e | 6f00 | 7170 | 6c69 | 6e6b | 3931 | 3237 | 2e6f | 0066 | 696c | 6573 | 2e6f | 005f | 5343 | 4353 | 6964 | 0063 | 6c6f | 7365 |
| 4523500 | 2e6f | 006e | 6f65 | 7272 | 0063 | 7265 | 6174 | 2e6f | 006e | 6f65 | 7272 | 006f | 7065 | 6e2e | 6f00 | 6e6f | 6572 | 7200 | 7265 | 6e61 | 6d65 | 2e6f | 006e | 6f65 |
| 4523560 | 7272 | 0075 | 6e6c | 696e | 6b2e | 6f00 | 6e6f | 6572 | 7200 | 7170 | 6c69 | 6e6b | 3931 | 3237 | 2e6f | 0063 | 7472 | 2e6f | 005f | 5343 | 4353 | 6964 | 0071 | 706c |
| 4523640 | 696e | 6b39 | 3132 | 372e | 6f00 | 6d61 | 7468 | 2e6f | 005f | 5146 | 496d | 696e | 005f | 5146 | 496d | 6178 | 005f | 5343 | 4353 | 6964 | 0066 | 6162 | 732e | 6f00 |
| 4523720 | 6672 | 6578 | 702e | 6f00 | 6965 | 6565 | 5f76 | 616c | 732e | 6f00 | 6c64 | 6578 | 702e | 6f00 | 6d6f | 6466 | 2e6f | 0070 | 6f77 | 2e6f | 0061 | 636f | 732e | 6f00 |
| 4524000 | 6173 | 696e | 2e6f | 0062 | 6573 | 7365 | 6c2e | 6f00 | 6c67 | 616d | 6d61 | 2e6f | 006c | 6f67 | 3130 | 2e6f | 0072 | 656d | 6169 | 6e64 | 6572 | 2e6f | 0066 | 6d6f |
| 4524060 | 642e | 6f00 | 7461 | 6e68 | 2e6f | 0061 | 7461 | 6e32 | 2e6f | 0061 | 7461 | 6e2e | 6f00 | 6c6f | 672e | 6f00 | 636f | 7368 | 2e6f | 0073 | 696e | 682e | 6f00 | 6578 |
| 4524140 | 706d | 312e | 6f00 | 6578 | 702e | 6f00 | 7472 | 6967 | 2e6f | 005f | 6172 | 675f | 7265 | 642e | 6f00 | 5f73 | 6c6f | 775f | 6172 | 675f | 7265 | 642e | 6f00 | 6965 |
| 4524220 | 6565 | 5f66 | 756e | 632e | 6f00 | 6879 | 706f | 742e | 6f00 | 7371 | 7274 | 2e6f | 0053 | 5649 | 445f | 6c69 | 626d | 5f65 | 7272 | 2e6f | 006d | 6174 | 6865 | 7272 |
| 4524300 | 2e6f | 0072 | 696e | 742e | 6f00 | 6469 | 762e | 6f00 | 6d75 | 6c74 | 6970 | 6c79 | 2e6f | 0077 | 7269 | 7465 | 2e6f | 006e | 6f65 | 7272 | 0071 | 706c | 696e | 6b39 |
| 4524360 | 3132 | 372e | 6f00 | 7374 | 7269 | 6e67 | 732e | 6f00 | 5f53 | 4343 | 5369 | 6400 | 5f73 | 6574 | 5f76 | 6563 | 005f | 7365 | 745f | 6374 | 7200 | 5f62 | 6c00 | 5f62 |
| 4524440 | 7000 | 5f62 | 7974 | 655f | 6275 | 6666 | 6572 | 0072 | 656d | 2e6f | 0061 | 746f | 662e | 6f00 | 6174 | 6f6c | 2e6f | 0065 | 6376 | 742e | 6f00 | 7374 | 7274 | 6f64 |
| 4524520 | 2e6f | 0073 | 7973 | 7465 | 6d2e | 6f00 | 7374 | 7269 | 6e67 | 5f64 | 6563 | 696d | 2e6f | 0065 | 636f | 6e76 | 6572 | 742e | 6f00 | 6465 | 6369 | 6d61 | 6c5f | 6269 |
| 4524600 | 6e2e | 6f00 | 646f | 7562 | 6c65 | 5f64 | 6563 | 696d | 2e6f | 0070 | 6163 | 6b5f | 666c | 6f61 | 742e | 6f00 | 756e | 7061 | 636b | 5f64 | 6f75 | 626c | 652e | 6f00 |
| 4524660 | 756e | 7061 | 636b | 5f66 | 6c6f | 6174 | 2e6f | 0073 | 7072 | 696e | 7466 | 2e6f | 0065 | 7965 | 636c | 2e6f | 0077 | 6169 | 742e | 6f00 | 6578 | 6563 | 7665 | 2e6f |
| 4524740 | 006e | 6f65 | 7272 | 0077 | 6169 | 7434 | 2e6f | 006e | 6f65 | 7272 | 004f | 7666 | 6f72 | 6b2e | 6f00 | 5f65 | 7869 | 742e | 6f00 | 756d | 756c | 7469 | 706c | 792e |
| 4525020 | 6f00 | 6261 | 7365 | 5f63 | 6f6e | 762e | 6f00 | 646f | 7072 | 6e74 | 2e6f | 0066 | 6c73 | 6275 | 662e | 6f00 | 6673 | 7461 | 742e | 6f00 | 6e6f | 6572 | 7200 | 7374 |
| 4525100 | 726c | 656e | 2e6f | 0069 | 7361 | 7474 | 792e | 6f00 | 6d65 | 6d63 | 6872 | 2e6f | 0067 | 636f | 6e76 | 6572 | 742e | 6f00 | 6669 | 6e64 | 696f | 702e | 6f00 | 6765 |
| 4525160 | 7464 | 7461 | 626c | 6573 | 697a | 652e | 6f00 | 6e6f | 6572 | 7200 | 696f | 6374 | 6c2e | 6f00 | 6e6f | 6572 | 7200 | 7170 | 6c69 | 6e6b | 3931 | 3237 | 2e6f | 0064 |
| 4525240 | 6174 | 652e | 6f00 | 5f53 | 4343 | 5369 | 6400 | 5f64 | 6f64 | 6563 | 005f | 646f | 6e74 | 6800 | 5f64 | 6f73 | 7472 | 005f | 6170 | 6d00 | 5f6a | 756c | 6461 | 7900 |
| 4525320 | 5f64 | 6179 | 005f | 646f | 6e00 | 6c6f | 6361 | 6c74 | 696d | 652e | 6f00 | 7374 | 7263 | 6174 | 2e6f | 0074 | 696d | 652e | 6f00 | 6163 | 6365 | 7373 | 2e6f | 006e |
| 4525400 | 6f65 | 7272 | 0067 | 6574 | 7469 | 6d65 | 6f66 | 6461 | 792e | 6f00 | 6e6f | 6572 | 7200 | 7265 | 6164 | 2e6f | 006e | 6f65 | 7272 | 0073 | 7472 | 6370 | 792e | 6f00 |
| 4525460 | 6765 | 7465 | 6e76 | 2e6f | 0071 | 706c | 696e | 6b39 | 3132 | 372e | 6f00 | 6469 | 7265 | 6374 | 6f72 | 792e | 6f00 | 5f53 | 4343 | 5369 | 6400 | 5f70 | 6174 | 7465 |
| 4525540 | 726e | 005f | 6d75 | 7374 | 005f | 646e | 616d | 6500 | 5f64 | 7461 | 696c | 005f | 5144 | 6d61 | 7463 | 6800 | 5f73 | 7461 | 7200 | 5f64 | 6f74 | 646f | 7400 | 5f64 |
| 4525620 | 6f74 | 005f | 6d75 | 7374 | 6e74 | 005f | 6469 | 7270 | 0073 | 7472 | 636d | 702e | 6f00 | 636c | 6f73 | 6564 | 6972 | 2e6f | 0067 | 6574 | 6772 | 656e | 742e | 6f00 |
| 4525700 | 6765 | 7470 | 7765 | 6e74 | 2e6f | 0067 | 6574 | 7764 | 2e6f | 006d | 6b74 | 656d | 702e | 6f00 | 6d6e | 7465 | 6e74 | 2e6f | 006f | 7065 | 6e64 | 6972 | 2e6f | 0072 |
| 4525760 | 6561 | 6464 | 6972 | 2e6f | 0073 | 7472 | 6e63 | 6d70 | 2e6f | 0073 | 7472 | 6e63 | 7079 | 2e6f | 0073 | 7472 | 746f | 6c2e | 6f00 | 6765 | 746e | 6574 | 6772 | 656e |
| 4526040 | 742e | 6f00 | 696e | 6e65 | 7467 | 722e | 6f00 | 6667 | 6574 | 732e | 6f00 | 6673 | 6565 | 6b2e | 6f00 | 7265 | 772e | 6f00 | 6669 | 6c62 | 7566 | 2e6f | 0066 | 6f70 |
| 4526120 | 656e | 2e6f | 0066 | 7072 | 696e | 7466 | 2e6f | 0066 | 6c6f | 636b | 2e6f | 006e | 6f65 | 7272 | 0065 | 7472 | 756e | 6361 | 7465 | 2e6f | 006e | 6f65 | 7272 | 0067 |
| 4526200 | 6574 | 6465 | 6e74 | 732e | 6f00 | 6e6f | 6572 | 7200 | 6765 | 7470 | 6167 | 6573 | 697a | 652e | 6f00 | 6e6f | 6572 | 7200 | 6765 | 7470 | 6964 | 2e6f | 006e | 6f65 |
| 4526260 | 7272 | 006c | 7374 | 6174 | 2e6f | 006e | 6f65 | 7272 | 0075 | 6161 | 736b | 2e6f | 006e | 6f65 | 7272 | 006d | 6d61 | 702e | 6f00 | 6c73 | 6565 | 6b2e | 6f00 | 6e6f |
| 4526340 | 6572 | 7200 | 7970 | 5f62 | 696e | 642e | 6f00 | 7970 | 5f65 | 6e75 | 6d2e | 6f00 | 7970 | 5f6d | 6174 | 6368 | 2e6f | 0079 | 7078 | 6472 | 2e6f | 0079 | 7076 | 315f |
| 4526420 | 7864 | 722e | 6f00 | 6263 | 6d70 | 2e6f | 0062 | 636f | 7079 | 2e6f | 0069 | 6e64 | 6578 | 2e6f | 006d | 656d | 6363 | 7079 | 2e6f | 0073 | 7472 | 7062 | 726b | 2e6f |
| 4526500 | 0073 | 7973 | 6c6f | 672e | 6f00 | 736c | 6565 | 702e | 6f00 | 636c | 6e74 | 5f75 | 6470 | 2e6f | 0072 | 7063 | 5f64 | 7461 | 626c | 6573 | 697a | 652e | 0070 | 6d61 |
| 4526560 | 705f | 6765 | 7470 | 6f72 | 742e | 6f00 | 706d | 6170 | 5f70 | 726f | 742e | 6f00 | 7270 | 635f | 7072 | 6f74 | 2e6f | 0078 | 6472 | 2e6f | 0078 | 6472 | 5f6d | 656d |
| 4526640 | 2e6f | 0076 | 7370 | 7269 | 6e74 | 662e | 6f00 | 6269 | 6e64 | 2e6f | 006e | 6f65 | 7272 | 0063 | 6f6e | 6e65 | 6374 | 2e6f | 006e | 6f65 | 7272 | 0064 | 7570 | 2e6f |
| 4526720 | 006e | 6f65 | 7272 | 0064 | 7570 | 322e | 6f00 | 6e6f | 6572 | 7200 | 6663 | 6e74 | 6c2e | 6f00 | 6e6f | 6572 | 7200 | 6765 | 7464 | 6f6d | 6169 | 6e6e | 616d | 652e |
| 4527000 | 6f00 | 6e6f | 6572 | 7200 | 6765 | 7473 | 6f63 | 6b6e | 616d | 652e | 6f00 | 6e6f | 6572 | 7200 | 7265 | 6376 | 6672 | 6f6d | 2e6f | 006e | 6f65 | 7272 | 0073 | 656c |
| 4527060 | 6563 | 742e | 6f00 | 6e6f | 6572 | 7200 | 7365 | 6e64 | 746f | 2e6f | 006e | 6f65 | 7272 | 0073 | 6574 | 6974 | 696d | 6572 | 2e6f | 006e | 6f65 | 7272 | 0073 | 6967 |
| 4527140 | 626c | 6f63 | 6b2e | 6f00 | 6e6f | 6572 | 7200 | 7369 | 6770 | 6175 | 7365 | 2e6f | 006e | 6f65 | 7272 | 0073 | 6967 | 7365 | 746d | 6173 | 6b2e | 6f00 | 6e6f | 6572 |
| 4527220 | 7200 | 736f | 636b | 6574 | 2e6f | 006e | 6f65 | 7272 | 0079 | 7070 | 726f | 745f | 6572 | 722e | 6f00 | 616c | 6172 | 6d2e | 6f00 | 6374 | 696d | 652e | 6f00 | 6269 |
| 4527300 | 6e64 | 7265 | 7376 | 706f | 7274 | 2e6f | 0061 | 7574 | 685f | 6e6f | 6e65 | 2e6f | 0061 | 7363 | 7469 | 6d65 | 2e6f | 005f | 6574 | 6578 | 7400 | 5f65 | 6461 | 7461 |
| 4527360 | 005f | 656e | 6400 | 7374 | 6172 | 7400 | 5f6d | 6169 | 6e00 | 5f65 | 6e76 | 6972 | 6f6e | 0051 | 3930 | 3030 | 3030 | 3300 | 5139 | 3030 | 3030 | 3031 | 0051 | 3930 |

```
4527440  3030 3030 3400 5139 3030 3030 3030 005f 5150 5f61 746f 6d5f 6672 6f6d 5f70 6164 6465 645f 7374 7269 6e67 005f 5139 4c4f
4527520  5445 5854 0051 3130 6100 5f51 505f 6174 6f6d 5f66 726f 645f 7374 7269 6e67 0051 3930 3030 3030 3200 5131 3062 0051 3130
4527600  6300 5139 3030 3030 3930 005f 5150 5f73 7072 696e 7466 0051 3930 3030 3032 3500 5f51 394c 4f44 4154 4100 5f51 3948 4944
4527660  4154 4100 5f51 505f 464c 5553 4800 5139 3030 3030 3337 0051 3130 6400 5139 3030 3030 3137 0051 3930 3030 3131 3600 5139
4527740  3030 3030 3931 005f 5150 5f73 7464 6572 7200 5131 3065 0051 3930 3030 3030 3600 5131 3066 0051 3130 6700 5139 3030 3030
4530020  3833 0051 3130 6900 5139 3030 3030 3136 0051 3930 3030 3030 3700 5f51 3950 5345 5544 4f00 5f6d 616c 6c6f 6300 5139 3030
4530100  3030 3731 005f 5f69 6f62 0051 3130 6900 5131 306a 0051 3130 6b00 5131 306c 005f 5150 5f43 6861 7254 7970 6500 5f51 505f
4530160  586c 6174 6500 5139 3030 3030 3130 0051 3930 3030 3132 3500 5139 3030 3031 3239 0051 3930 3030 3130 3800 5139 3030 3031
4530240  3238 0051 3930 3030 3037 3000 5139 3030 3030 3837 0051 3130 6d00 5131 306e 0051 3930 3030 3030 3500 5131 306f 005f 6572
4530320  726e 6f00 5f73 7373 5f65 7272 6c69 7374 005f 7379 735f 6e65 7272 0051 3930 3030 3032 3100 5f73 6967 7665 6300 5f73 6967
4530400  6e61 6c00 5131 3070 0051 3130 7100 5f51 505f 6163 7469 6f6e 005f 7265 616c 5f73 6967 7665 6300 5f51 505f 7075 7473 0051
4530460  3930 3030 3031 3800 5139 3030 3030 3438 0051 3130 7200 5131 3073 0051 3130 7400 5131 3075 0051 3130 7600 5f62 7a65 726f
4530540  0051 3130 7700 5131 3078 0051 3930 3030 3033 3400 5131 3079 0051 3130 7a00 5131 3061 6200 5139 3030 3030 3333 0051 3130
4530620  6262 0051 3130 6362 0051 3130 6462 0051 3130 6562 0051 3130 6662 0051 3130 6762 0051 3130 6862 0051 3130 6962 0051 3130
4530700  6a62 0051 3130 6b62 0051 3130 6c62 0051 3130 6d62 0051 3130 6e62 0051 3130 6f62 0051 3130 7062 0051 3930 3030 3038 3400
4530760  5139 3030 3031 3031 005f 6672 6565 0051 3930 3030 3033 3500 5131 3071 6200 5139 3030 3030 3831 0051 3130 7262 0051 3930
4531040  3030 3039 3200 5139 3030 3030 3635 0051 3930 3030 3036 3900 5139 3030 3031 3133 0051 3930 3030 3033 3800 5131 3073 6200
4531120  5139 3030 3030 3539 0051 3930 3030 3036 3600 5139 3030 3030 3735 0051 3930 3030 3038 3000 5139 3030 3030 3739 005f 5150
4531200  5f6d 616b 655f 7374 7265 616d 0051 3930 3030 3130 3200 5139 3030 3031 3033 0051 3930 3030 3036 3000 5f51 505f 484f 4b4f
4531260  005f 5150 5f70 7574 6300 5f51 505f 6765 7463 0051 3130 7462 0051 3930 3030 3038 3600 5139 3030 3030 3139 0051 3930 3030
4531340  3034 3200 5139 3030 3030 3230 0051 3930 3030 3032 3200 5139 3030 3030 3633 0051 3930 3030 3036 3700 5139 3030 3030 3736
4531420  0051 3930 3030 3038 3500 5139 3030 3030 3135 0051 3930 3030 3033 3600 5f51 505f 7370 7574 6300 5f51 505f 7367 6574 6300
4531500  5f51 505f 6375 7269 6e00 5f51 505f 7374 6469 6e00 5f51 505f 7370 7574 7300 5139 3030 3030 3631 0051 3130 7562 0051 3930
4531560  3030 3038 3800 5139 3030 3030 3936 0051 3130 7662 0051 3130 7762 0051 3930 3030 3037 3200 5f51 505f 7072 696e 7466 005f
4531640  5150 5f63 7572 6f75 7400 5f51 505f 7374 646f 7574 0051 3930 3030 3038 3200 5139 3030 3030 3532 0051 3930 3030 3036 3200
4531720  5139 3030 3031 3236 0051 3930 3030 3032 3600 5139 3030 3030 3431 005f 7265 616c 6c6f 6300 5f63 6672 6565 005f 6d65 6d61
4532000  6c69 676e 005f 6361 6c6c 6f63 005f 7661 6c6c 6f63 0051 3130 7862 0051 3130 7962 0051 3130 7a62 0051 3930 3030 3035 3100
4532060  5139 3030 3030 3433 0051 3130 6163 0051 3130 6263 0051 3930 3030 3131 3700 5139 3030 3030 3533 0051 3130 6363 0051 3130
4532140  6463 0051 3130 6563 0051 3130 6663 0051 3930 3030 3131 3500 5131 3067 6300 5139 3030 3030 3434 0051 3130 6863 0051 3130
4532220  6963 0051 3930 3030 3038 3900 5139 3030 3030 3933 0051 3930 3030 3039 3400 5139 3030 3030 3935 005f 6272 6b00 5f51 3948
4532300  4954 4558 5400 5131 306a 6300 5131 306b 6300 5f73 6272 6b00 5139 3030 3030 3939 0051 3930 3030 3131 3800 5f51 505f 7365
4532360  7400 5131 306c 6300 5139 3030 3030 3331 0051 3930 3030 3130 3600 5139 3030 3030 3530 0051 3930 3030 3130 3700 5139 3030
4532440  3031 3035 0051 3930 3030 3033 3200 5139 3030 3031 3034 0051 3930 3030 3037 3800 5139 3030 3030 3430 0051 3930 3030 3130
4532520  3000 5139 3030 3030 3436 0051 3930 3030 3132 3700 5f5f 6374 7970 655f 0051 3930 3030 3030 3900 5139 3030 3030 3133 0051
4532600  3930 3030 3036 3400 5139 3030 3030 3134 0051 3930 3030 3032 3700 5139 3030 3030 3734 0051 3930 3030 3037 3700 5139 3030
4532660  3930 3733 0051 3930 3030 3035 3500 5139 3030 3031 3131 0051 3930 3030 3131 3200 5139 3030 3031 3130 0051 3930 3030 3130
4532740  3900 5139 3030 3030 3938 0051 3930 3030 3032 3900 5139 3030 3030 3538 0051 3930 3030 3033 3000 5f51 505f 7061 6464 6564
4533020  5f73 7472 696e 675f 6672 6f6d 5f61 746f 6d00 5139 3030 3031 3330 005f 5150 5f73 7472 696e 675f 6672 6f6d 5f61 746f 6d00
4533100  5139 3030 3030 3536 0051 3930 3030 3032 3800 5139 3030 3030 3537 0051 3930 3030 3034 3700 5139 3030 3030 3038 0051 3930
4533160  3030 3132 3100 5139 3030 3031 3139 0051 3930 3030 3035 3400 5139 3030 3031 3134 0051 3930 3030 3132 3200 5139 3030 3031
4533240  3234 0051 3930 3030 3132 3300 5139 3030 3031 3230 0051 3930 3030 3039 3700 5f72 6561 6c5f 7369 676e 616c 005f 7265 616c
4533320  5f73 6272 6b00 5131 306d 6300 5f72 6561 6c5f 6272 6b00 5131 306e 6300 5139 3030 3030 3233 0051 3930 3030 3031 3200 5139
4533400  3030 3030 3435 0051 3930 3030 3031 3100 5139 3030 3030 3234 0051 3930 3030 3033 3900 5139 3030 3030 3638 0051 3130 6f63
4533460  0051 3930 3030 3034 3900 5131 3070 6300 5f5f 7369 6766 756e 6300 5f51 4161 7267 6300 5f51 4162 6967 6500 5f51 4162 6e67
4533540  6500 5f51 4165 7678 6e00 5f51 416e 6578 7400 5f61 6c74 6572 5f61 7761 6974 696e 675f 7265 706c 6965 7300 5f67 6574 5f61
4533620  7761 6974 696e 675f 7265 706c 6965 7300 5f67 6574 5f62 6174 6368 696e 6700 5f69 6e69 745f 7072 6f77 696e 646f 7773 005f
4533700  696e 6974 5f72 6563 6569 7665 5f62 7566 6665 7200 5f69 6e69 745f 7365 6e64 5f62 7566 6665 7200 5f6b 696c 6c5f 7072 6f77
4533760  696e 646f 7773 005f 7072 6f77 696e 646f 7773 5f65 7869 7374 7300 5f72 6563 6569 7665 5f66 756e 6374 6f72 005f 7365 6e64
4534040  5f66 756e 6374 6f72 005f 7365 6e64 5f69 6e74 6567 6572 005f 7365 745f 6177 6169 7469 6e67 5f72 6570 6c69 6573 005f 7365
4534120  745f 6261 7463 6869 6e67 005f 7472 616e 7363 6974 5f73 656e 645f 6275 6666 6572 005f 636c 6f73 655f 7072 6f77 696e 646f
4534200  7773 5f70 6970 655f 656e 6473 005f 7072 6f77 696c 646f 7773 5f6f 7574 005f 6368 696c 6400 5f63 6869 6c64 5f63 6861 6e67
4534260  6564 005f 7261 775f 7255 6365 6976 655f 6675 6e63 746f 7200 5f70 7700 5f6f 6e41 5375 6e43 6f6e 736f 6c65 005f 7072 6f77
4534340  696e 646f 7773 5f69 6e00 5f70 726f 7769 6e64 6f77 735f 6163 7469 7665 005f 7770 005f 7665 7269 6679 5f6c 656e 6774 6800
4534420  5f63 6c6f 7365 5f70 726f 6c6f 675f 7069 7065 5f65 6e64 7300 5f73 746f 7265 5f62 7974 6500 5f73 7472 6561 6d5f 746f 5f62
4534500  7974 655f 7665 6374 6f72 005f 6e65 775f 6279 7465 5f76 6563 746f 7200 5f66 7265 655f 6279 7465 5f73 7472 6561 6d00 5f66
```

```
4534560 7265 655f 6279 7465 5f76 6563 746f 7200 5f62 7974 655f 7374 7265 616d 5f63 6f6e 7465 6e74 7300 5f73 7472 6561 6d5f 6672
4534640 6f6d 5f62 7974 655f 7665 6374 6f72 005f 6665 7463 685f 6279 7465 005f 5150 5f4c 3000 5f51 505f 4c31 005f 6e6f 7469 6365
4534720 5f63 6861 6e67 6564 5f69 6473 005f 7361 6363 6573 7300 5f73 7461 7400 5f67 6574 6772 6f75 7073 005f 6561 6363 6573 7300
4535000 5f67 6574 6575 6964 0063 6572 726f 7200 5f51 6465 6c65 7465 005f 5172 656e 616d 6500 5f51 6163 6365 7373 005f 5163 616e
4535060 6f70 656e 005f 5150 5f4c 3200 5f63 6c6f 7365 005f 6372 6561 7400 5f6f 7065 6e00 5f72 656e 616d 6500 5f75 6e6c 696e 6b00
4535140 5f51 505f 4c33 005f 6374 725f 6f70 3200 5f63 7472 5f6f 7033 005f 6374 725f 7661 6c00 5f63 7472 005f 706f 7700 5f66 6162
4535220 7300 5f51 4665 5e63 6400 5f51 4664 6563 6400 5f51 466a 6f69 6e00 5f51 4672 6d64 7200 5f51 4670 6172 7400 5f51 4970 6172
4535300 7400 5f51 4663 6f6e 7600 5f51 4963 6f6e 7600 5f63 6f70 7973 6967 6e00 5f73 696e 005f 7461 6e00 5f61 7461 6e32 005f 6174
4535360 616e 6900 5f61 636f 7368 005f 6173 696e 6800 5f67 616d 6d61 005f 6879 706f 7400 5f73 696e 6800 5f73 7172 7400 5f74 616e
4535440 6800 5f6c 6f67 3130 005f 6c64 6578 7000 5f6a 3000 5f6a 3100 5f6a 6e00 5f63 6f73 005f 6578 7000 5f51 505f 4c34 005f 7170
4535520 5f70 6f77 005f 6174 616e 005f 6173 696e 005f 6163 6f73 005f 6c6f 6700 5f79 3000 5f79 3100 5f63 6f73 6800 5f79 6e00 5f6d
4535600 6f64 6600 5f69 6e66 696e 6974 7900 5f66 7265 7870 005f 666c 6f6f 7200 5f72 656d 6169 6e64 6572 005f 6365 696c 005f 696c
4535660 6f67 6200 5f73 6361 6c62 6e00 5f71 7569 6574 5f6e 616e 005f 6d61 785f 7375 626e 6f72 6d61 6c00 5f6d 696e 5f73 7562 6e6f
4535740 726d 616c 005f 7369 676e 616c 696e 675f 6e61 6e00 5f6d 6178 5f6e 6f72 6d61 6c00 5f6d 696e 5f6e 6f72 6d61 6c00 5f61 696e
4536020 7400 5f53 5649 445f 6c69 626d 5f65 7272 005f 6e69 6e74 005f 7269 6e74 002e 6d75 6c00 5f61 6e69 6e74 005f 7369 676e 6761
4536100 6d00 5f6c 6761 6d6d 6100 5f66 705f 6469 7265 6374 696f 6e00 5f66 6d6f 6400 5f64 7265 6d00 5f65 7870 6d31 005f 6670 5f70
4536160 6900 5f73 696e 636f 7300 5f5f 6172 675f 7265 6400 5f5f 736c 6f77 5f61 7267 5f72 6564 002e 6469 7600 5f69 7373 7562 6e6f
4536240 726d 616c 005f 7369 676e 6269 7400 5f69 736e 6f72 6d61 6c00 5f69 7369 6e66 005f 6973 6e61 6e00 5f66 696e 6974 6500 5f6e
4536320 6578 7461 6674 6572 005f 6973 7a65 726f 005f 6d61 7468 6572 7200 5f77 7269 7465 005f 6670 5f61 6363 7275 6564 5f65 7863
4536400 6570 7469 6f6e 7300 5f69 7269 6e74 002e 7564 6976 005f 5167 4174 6f6d 005f 5170 4174 6f6d 005f 5167 466f 7572 005f 5170
4536460 466f 7572 005f 5170 5061 7274 005f 5167 496e 6974 005f 5170 496e 6974 005f 5169 6e64 6578 005f 5161 746f 6463 6800 5f51
4536540 6f75 7463 686b 005f 5173 7562 6368 6b00 5f51 6368 6174 6f6d 005f 5173 7973 7465 6d00 5f51 7374 726c 656e 005f 5169 6e73
4536620 7374 7200 5f51 6f75 7473 7472 005f 5163 6d70 7374 7200 5f51 7375 6273 7472 005f 5173 7472 6368 7200 5f51 505f 4c35 005f
4536700 5167 4f6e 6500 5f51 704f 6e65 005f 5167 4e75 6d00 5f51 7370 616e 005f 5170 466c 7400 5f51 7049 6e74 002e 7265 6d00 5f73
4536760 7072 696e 7466 005f 6174 6f66 005f 6174 6f6c 005f 7379 7374 656d 005f 6563 7674 002e 7572 656d 005f 7374 7274 6f64 005f
4537040 6663 7674 005f 6563 6f5e 7665 7274 005f 6663 6f6e 7665 7274 005f 6465 6369 6d61 6c5f 746f 5f64 6f75 626c 6500 5f73 7472
4537120 696e 675f 746f 5f64 6563 696d 616c 005f 5f65 7869 7400 5f65 7865 636c 005f 7761 6974 005f 7666 6f72 6b00 5f64 6f75 626c
4537200 655f 746f 5f64 6563 696d 616c 005f 5f71 756f 7265 6d31 3030 3030 005f 5f70 6163 6b5f 646f 7562 6c65 005f 5f70 6163 6b5f
4537260 7369 6e67 6c65 005f 6465 6369 6d61 6c5f 746f 5f62 696e 6172 795f 6672 6163 7469 6f6e 005f 6465 6369 6d61 6c5f 746f 5f65
4537340 7874 656e 6465 6400 5f64 6563 696d 616c 5f74 6f5f 756e 7061 636b 6564 005f 5f66 705f 6e6f 726d 616c 697a 6500 2e75 6d75
4537420 6c00 5f5f 6d75 6c5f 3130 3030 3000 5f5f 6d75 6c5f 3635 3533 3600 5f5f 6670 5f63 7572 7265 6e74 5f70 7265 6369 7369 6f6e
4537500 005f 5f66 705f 6375 7272 656e 745f 6469 7265 6374 696f 6e00 5f64 6563 696d 616c 5f74 6f5f 7369 6e67 6c65 005f 5f70 6163
4537560 6b5f 6578 7465 6e64 6564 005f 6465 6369 6d61 6c5f 746f 5f62 696e 6172 795f 696e 7465 6765 7200 5f5f 6670 5f63 7572 7265
4537640 6e74 5f65 7863 6570 7469 6f6e 7300 5f62 696e 6172 795f 746f 5f64 6563 696d 616c 5f66 7261 6374 696f 6e00 5f63 6c61 7373
4537720 5f64 6f75 626c 6500 5f64 6563 696d 616c 5f72 6f75 6e64 005f 756e 7061 636b 6564 5f74 6f5f 6465 6369 6d61 6c00 5f5f 756e
4540000 7061 636b 5f64 6f75 626c 6500 5f5f 6670 5f72 6967 6874 7368 6966 7400 5f62 696e 6172 795f 746f 5f64 6563 696d 616c 5f69
4540060 6e74 6567 6572 005f 5f66 6f75 7264 6967 6974 7300 5f5f 7061 636b 5f69 6e74 6567 6572 005f 5f66 705f 7365 745f 6578 6365
4540140 7074 696f 6e00 5f5f 756e 7061 636b 5f73 696e 676c 6500 5f5f 6670 5f6c 6566 7473 6869 6674 005f 636c 6173 735f 7369 6e67
4540220 6c65 005f 5f75 6e70 6163 6b5f 6578 7465 6e64 6564 005f 636c 6173 735f 6578 7465 6e64 6564 005f 5f75 6e70 6163 6b5f 696e
4540300 7465 6765 7200 5f5f 646f 7072 6e74 005f 6579 6563 7665 005f 7761 6974 3400 5f67 636f 6e76 6572 7400 5f5f 7772 7463 686b
4540360 005f 6d65 6d63 6872 005f 7374 726c 656e 005f 5f78 656c 7362 7566 005f 6673 7461 7400 5f5f 736d 6275 6600 5f5f 6677 616c
4540440 6b00 5f66 636c 6f73 6500 5f66 666c 7573 6800 5f69 7361 7474 7900 5f5f 666c 7362 7566 005f 5f62 7566 7379 6e63 005f 5f66
4540520 696e 6462 7566 005f 5f63 6c65 616e 7570 005f 696f 6374 6c00 5f67 6376 7400 5f5f 6763 7674 005f 5f66 5f6d 6f72 6566 696c
4540600 6573 005f 6765 7464 7461 626c 6573 697a 6500 5f66 5f70 7265 616c 6c6f 6300 5f5f 6669 6e64 696f 7000 5f51 4464 6174 6500
4540660 5f51 4477 6865 6e00 5f51 4470 6c75 7300 5f51 4434 6d61 7400 5f51 505f 4c36 005f 5144 6f66 776b 005f 7469 6d65 005f 6c6f
4540740 6361 6c74 696d 6500 5f67 6d74 696d 6500 5f6f 6666 7469 6d65 005f 7265 6164 005f 6163 6365 7373 005f 6765 7465 6e76 005f
4541020 747a 7365 7400 5f74 7a73 6574 7761 6c6c 005f 7374 7263 6174 005f 7374 7263 7079 005f 6765 7474 696d 656f 6664 6179 005f
4541100 5144 6865 7265 005f 5144 6e61 6d65 005f 5144 7072 6f70 005f 5144 7465 7374 005f 5144 7061 7274 005f 5144 6e65 7874 005f
4541160 5144 696e 6974 005f 5150 5f4c 3700 5f63 6c6f 7365 6469 7200 5f6f 7065 6e64 6972 005f 6765 7470 7775 6964 005f 6765 7467
4541240 7267 6964 005f 7265 6164 6469 7200 5f67 6574 7764 005f 7374 7263 6d70 005f 7573 696e 6779 706d 6170 005f 656e 6467 7265
4541320 6e74 005f 6765 7467 726e 616d 005f 6765 7467 7265 6e74 005f 7374 726e 6370 7900 5f62 636f 7079 005f 666f 7065 6e00 5f66
4541400 6765 7473 005f 7970 5f6e 6578 7400 5f66 6765 7467 7265 6e74 005f 7365 7467 7265 6e74 005f 7970 5f6d 6174 6368 005f 7970
4541460 5f66 6972 7374 005f 7365 7467 726a 756e 6b00 5f72 6577 696e 6400 5f73 7472 746f 6c00 5f5f 7077 5f73 7461 796f 7065 6e00
4541540 5f65 6e64 7077 656e 7400 5f67 6574 7077 6e61 6d00 5f67 6574 7077 656e 7400 5f73 6574 6e65 7467 7265 6e74 005f 7365 7470
4541620 7765 6e74 005f 7365 7470 7766 696c 6500 5f69 6e6e 6574 6772 005f 656e 646e 6574 6772 656e 7400 5f67 6574 6e65 7467 7265
```

4541700 6e74 005f 6d6d 6170 005f 656e 646d 6e74 656e 7400 5f66 7472 756e 6361 7465 005f 6765 746d 6e74 656e 7400 5f6c 7365 656b
4541760 005f 6c73 7461 7400 5f75 6d61 736b 005f 7365 746d 6e74 656e 7400 5f6d 6b74 656d 7000 5f67 6574 7061 6765 7369 7a65 005f
4542040 6765 7470 6964 005f 7374 726e 636d 7000 5f61 6464 616e 7465 6e74 005f 6673 6565 6b00 5f66 6c6f 636b 005f 6d61 736d 6e74
4542120 6f70 7400 5f5f 616e 7400 5f66 7072 696e 7466 005f 6765 7464 656e 7473 005f 7374 7270 6272 6b00 5f69 6e64 6578 005f 4e45
4542200 5447 524f 5550 005f 6d65 6d63 6370 7900 5f5f 6669 6c62 7566 005f 6672 656f 7065 6e00 5f78 6472 5f79 7064 6f6d 6169 6e5f
4542260 7772 6170 5f73 7472 696e 6700 5f5f 7970 736c 6565 7074 696d 6500 5f78 6472 5f75 5f6c 6f6e 6700 5f79 705f 6765 745f 6465
4542340 6661 756c 745f 646f 6d61 696e 005f 6663 6e74 6c00 5f79 705f 6269 6e64 005f 5f79 705f 646f 6269 6e64 005f 7864 725f 7970
4542420 6269 6e64 5f72 6573 7000 5f67 6574 646f 6d61 696e 6e61 6d65 005f 636c 6e74 7564 705f 6275 6663 7265 6174 6500 5f78 6472
4542500 5f76 6f69 6400 5f78 6472 5f70 6d61 7000 5f73 6c65 6570 005f 6475 7000 5f63 6f6e 6e65 6374 005f 7970 5f75 6e62 696e 6400
4542560 5f5f 7970 7365 7276 5f74 696d 656f 7574 005f 7379 736c 6f67 005f 736f 636b 6574 005f 6269 6e64 005f 6475 7032 005f 6765
4542640 7473 6f63 6b6e 616d 6500 5f79 7070 726f 745f 6572 7200 5f76 3170 726f 745f 646f 6669 7273 7400 5f78 6472 5f79 7072 6573
4542720 705f 6b65 795f 7661 6c00 5f78 6472 5f79 7072 6571 5f6e 6f6b 6579 005f 5f78 6472 5f79 7072 6571 7565 7374 005f 5f78 6472
4543000 5f79 7072 6573 706f 6e73 6500 5f62 636d 7000 5f76 3170 726f 745f 646f 6e65 7874 005f 7864 725f 7970 7265 715f 6b65 7900
4543060 5f78 6472 5f79 7072 6573 705f 7661 6c00 5f78 6472 5f6f 7061 7175 6500 5f78 6472 5f73 7472 696e 6700 5f78 6472 5f79 706d
4543140 6170 5f77 7261 705f 7374 7269 6e67 005f 7864 725f 7970 5f62 696e 6469 6e67 005f 7864 725f 7970 6d61 705f 7061 726d 7300
4543220 5f78 6472 5f65 6e75 6d00 5f78 6472 5f79 706f 776e 6572 5f77 7261 705f 7374 7269 6e67 005f 7864 725f 6461 7475 6d00 5f78
4543300 6472 5f62 7974 6573 005f 7864 725f 7970 5f69 6e61 6464 7200 5f5f 7864 725f 7970 6269 6e64 5f6f 6c64 7365 7464 6f6d 005f
4543360 7864 725f 756e 696f 6e00 5f73 6574 6c6f 676d 6173 6b00 5f73 6967 7365 746d 6173 6b00 5f63 6c6f 7365 6c6f 6700 5f6f 7065
4543440 6e6c 6f67 005f 616c 6172 6d00 5f63 7469 6d65 005f 7673 7973 6c6f 6700 5f73 6967 626c 6f63 6b00 5f76 7370 7269 6e74 6600
4543520 5f73 656e 6474 6f00 5f73 6967 7061 7573 6500 5f73 6574 6974 696d 6572 005f 6269 6e64 7265 7376 706f 7274 005f 5f73 6574
4543600 6572 725f 7265 706c 7900 5f78 6472 5f63 616c 6c68 6472 005f 7265 6376 6672 6f6d 005f 706d 6170 5f67 6574 706f 7274 005f
4543660 5f6e 756c 6c5f 6175 7468 005f 7864 725f 6f70 6171 7565 5f61 7574 6800 5f78 6472 5f72 6570 6c79 6d73 6700 5f63 6c6e 7475
4543740 6470 5f63 7265 6174 6500 5f72 7063 5f63 7265 6174 6565 7272 005f 5f72 7063 5f64 7461 626c 6573 697a 6500 5f73 656c 6563
4544020 7400 5f61 7574 686e 6f6e 655f 6372 6561 7465 005f 7864 726d 656d 5f63 7265 6174 6500 5f78 6472 5f75 5f73 686f 7274 005f
4544100 7864 725f 7265 6a65 6374 6564 5f72 6570 6c79 005f 7864 725f 6163 6365 7074 6564 5f72 6570 6c79 005f 7864 725f 6465 735f
4544160 626c 6f63 6b00 5f78 6472 5f6e 6574 6f62 6a00 5f78 6472 5f75 5f63 6861 7200 5f78 6472 5f77 7261 7073 7472 696e 6700 5f78
4544240 6472 5f69 6e74 005f 7864 725f 6672 6565 005f 7864 725f 6c6f 6e67 005f 7864 725f 626f 6f6c 005f 7864 725f 6368 6172 005f
4544320 7864 725f 7368 6f72 7400 5f78 6472 5f75 5f69 6e74 005f 6173 6374 696d 6500
4544356

What is claimed is:

1. In an ECAD system, a method of creating and validating a structural description of a circuit or device from a higher level, behavior-oriented description thereof, comprising:

entering on an ECAD system a specification for a design of desired behavior of a device, including high-level timing goals, in a high level, behavior-oriented language;

on the ECAD system, iteratively simulating and changing the design of the device at the behavioral-level until the desired behavior is obtained;

on the ECAD system, partitioning the design of the device into a number of architectural blocks and constraining the architectural choices to those which meet the high-level timing goals, and on the ECAD system, directing the various architectural blocks to logic synthesis programs, said logic synthesis programs also running in the ECAD system, thereby providing a netlist or gate-level description of the design.

2. A method according to claim 1, wherein:

architectural blocks having highly regular structures or well understood functions are directed to specific logic synthesis programs running on the ECAD system (e.g. memory or function compilers); and architectural blocks with random or unstructured logic are directed to more general logic synthesis programs running on the ECAD system.

3. A method according to claim 1, further comprising:

on the ECAD system, simulating the gate-level design description; and on the ECAD system, comparing the results of the gate-level simulation with those from the behavioral simulation to ensure that the gate-level design description behaves as intended and that the timing goals are achieved.

4. A method according to claim 3, further comprising:

on the ECAD system, back-annotating the design to ensure that other physical design limitations, such as capacitive loads, are not exceeded.

5. A method according to claim 3, further comprising:

inputting to the ECAD system the net list or gate-level description of the design to a layout tool running on the ECAD system for creating a physical implementation of the design.

6. A method according to claim 1, further comprising:

an intermediate step, between the behavioral and net-list descriptions of the design, of generating a description of the design at the register transfer level.

7. A method according to claim 1, wherein:

the intent and meaning present in the behavioral description is preserved at the net list or gate-level description.

8. A method according to claim 1, further comprising:

in the partitioning step, providing to the ECAD system high-level timing information extracted from known chip floorplan parameters to constrain the design into the feasible architectural choices which meet the high-level timing goals, thereby allowing the process to converge to specific physical embodiments.

9. A method according to claim 8, further comprising:

on the ECAD system, extracting timing data from floorplan parameters; and incorporating this data into I/O ports of the high-level behavioral description.

10. A method according to claim 1, wherein the high-level behavioral description of the device is set forth in VHDL.

11. A method according to claim 1, further comprising:

interpreting the behavioral description of the device by attaching one or more semantic rules to each of the syntactic rules underlying the behavioral description, in the ECAD system.

12. A method according to claim 11, wherein the interpreting is accomplished by using a "syntax attribute tree".

13. In an ECAD system, a method of deriving a structural description of a system from a behavioral description thereof, comprising:

(a) specifying a behavioral design for a system in a high-level behavior-oriented language;

(b) describing, in the high-level language, a functional description of the design of the system, and inputting the functional description to the ECAD system;

(c) verifying in the high-level language, correctness of intended funtionality and, if necessary, iteratively simulating and changing the functional description of the system until the desired functionality is obtained;

(d) on the ECAD system, partitioning the functional description into a number of architectural blocks;

(e) on the ECAD system, constraining the architectural choices for the design to those which meet the desired behavior; and (f) on the ECAD system, mapping the architecturally constrained design into a structural description of the system.

14. A method according to claim 13, further comprising:

between the steps (e) and (f), composing the architectural choices as a structural description of the system; and on the ECAD system, verifying the architectural decisions that were made during partitioning.

15. A method according to claim 13, further comprising:

on the ECAD system, after the step (f), verifying the correctness of the of the structural description of the system.

16. In an ECAD system, a method of creating and validating a structural description of a device from a behavior-oriented description, comprising:

specifying a behavioral description for a desired behavior of a device in a high-level, behavior-oriented language, and inputting the behavioral description to an ECAD system;

on the ECAD system, iteratively simulating and changing the behavioral description until the desired behavior is obtained;

on the ECAD system, partitioning the behavioral description into architectural blocks;

on the ECAD system, synthesizing a structural description of the architectural blocks in a lower-level language; and on the ECAD system, simulating the funtionality of the structural description.

17. A method according to claims 16, wherein: the device is a circuit or a system.

18. A method according to claim 16, wherein: the device is a design entity; and the design entity is an entire system, a sub-system, a board, a chip, a macro-cell, a logic gate, or any level of abstraction in between.

19. A method according to claim 16, further comprising: on the ECAD system, implementing the structural description.

20. In an ECAD system, a method of partitioning the design of a digital device, comprising:

inputting a design to an ECAD system, and on the ECAD system performing the following steps;

partitioning a design into functional blocks;

generally laying out the partitioning design;

selecting existing design for a portion of the functional blocks;

generating another portion of the functional blocks;

partitioning yet another portion of the functional blocks into smaller functional units;

synthesizing the remaining portion of the functional blocks;

generating a structural description of the functional blocks and units;

predicting delays between functional blocks and units.

21. A method according to claim 20, further comprising: back-annotating the delays to provide timing optimization.

22. A method according to claim 20, further comprising: using the delays to derive boundary constraints for timing optimization.

23. In an ECAD system, a method of creating and validating a structural description of a circuit or device from a higher level, behavior-oriented description thereof, comprising:

(1) entering on an ECAD system a specification for an entire design of desired behavior of a device, including high-level timing goals, in a high-level, behavior-oriented language;

(2) on the ECAD system, deriving a functional description from the specification, including intended functionality;

(2.5) on the ECAD system, verifying the correctness of the intended functionality of the functional description;

(3) on the ECAD system, partitioning the functional description into a partitioned design having separate modules;

(4) on the ECAD system, describing the modules, and imposing on each module a set of timing and area constraints;

(5) on the ECAD system, reconstructing the partitioned design, and examining and verifying the partitioned design, to provide an RTL description of the entire design;

(6) on the ECAD system, verifying architectural decisions that were made during partitioning, and examining their impact on the functionality and performance of the entire design;

(7) on the ECAD system, providing a target technology library for the modules;

(8) on the ECAD system, mapping the design is mapped into the target technology;

(9) on the ECAD system, providing a gate-level, technology-dependent structural descriptions of the modules;

(10) on the ECAD system, verify the correctness of the structural descriptions of the modules against their intended functionality;

(11) on the ECAD system, associating specified timing and area constraints on the structural description of the modules;

(12) on the ECAD system, modifying the structural descriptions of the modules so that their area and timing characteristics comply with the specified constraints;

(13) on the ECAD system, deriving optimized structural description of the modules from the modified structural descriptions;

(14) on the ECAD system, examining the impact of the optimized structural descriptions of the modules on the entire design;

(15) on the ECAD system, deriving a high level module, from the optimized structural descriptions of the modules, wherein the high level module describes the interaction and connectivity between the modules, and creating higher level modules hierarchically from high level modules until the entire design is described in a highest level module;

(16) on the ECAD system, composing the optimized structural descriptions of the modules are composed (see step 5) together to implement the intended functionality of the highest level module;

(17) in the ECAD system, performing floor-planning for the modules, and determining more accurate intra-block and interblock delays;

(17.5) in the ECAD system, back annotating the delays into the structural descriptions of the modules; and

(18) in the ECAD system, further modifying the structural descriptions of the modules so that their area and timing characteristics comply with global constraints.

* * * * *